US012520653B2

(12) United States Patent
Kwak et al.

(10) Patent No.: US 12,520,653 B2
(45) Date of Patent: Jan. 6, 2026

(54) LIGHT-EMITTING DEVICE AND ELECTRONIC APPARATUS INCLUDING THE SAME

(71) Applicant: Samsung Electronics Co., Ltd., Suwon-si (KR)

(72) Inventors: Seungyeon Kwak, Suwon-si (KR); Hyungjun Kim, Suwon-si (KR); Myungsun Sim, Suwon-si (KR); Kum Hee Lee, Suwon-si (KR); Sunghun Lee, Hwaseong-si (KR); Jeoungin Yi, Seoul (KR); Byoungki Choi, Hwaseong-si (KR); Kyuyoung Hwang, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 946 days.

(21) Appl. No.: 17/526,857

(22) Filed: Nov. 15, 2021

(65) Prior Publication Data

US 2023/0089993 A1 Mar. 23, 2023

(30) Foreign Application Priority Data

Nov. 20, 2020 (KR) ........................ 10-2020-0156926
Nov. 12, 2021 (KR) ........................ 10-2021-0155885

(51) Int. Cl.
*H01L 51/00* (2006.01)
*H10K 50/11* (2023.01)
(Continued)

(52) U.S. Cl.
CPC ........... *H10K 50/11* (2023.02); *H10K 50/155* (2023.02); *H10K 50/165* (2023.02); *H10K 2101/40* (2023.02)

(58) Field of Classification Search
CPC ..... H10K 2101/40; H10K 50/11; H10K 50/13
See application file for complete search history.

(56) References Cited

U.S. PATENT DOCUMENTS 9,184,405 B2 11/2015 Song et al.
10,290,826 B2 5/2019 Kim et al.
(Continued)

FOREIGN PATENT DOCUMENTS

CN 111653679 A 9/2020
KR 101108156 B1 1/2012
(Continued)

OTHER PUBLICATIONS

English Abstract of KR 10-2011-0055250 (Corresponds to KR 10-1108156).
(Continued)

*Primary Examiner* — Alexander C Kollias
(74) *Attorney, Agent, or Firm* — CANTOR COLBURN LLP

(57) ABSTRACT

Provided are a light-emitting device and an electronic apparatus including the same, the light-emitting device including: a first electrode; a second electrode facing the first electrode; and an emission layer between the first electrode and the second electrode. The emission layer includes i) a first emission layer and ii) a second emission layer located between the first emission layer and the second electrode, the first emission layer is in direct contact with the second emission layer, the first emission layer includes a dopant, a first hole-transporting compound, and a first compound, the second emission layer includes a dopant, a second hole-transporting compound, and a second compound, the dopant included in the first emission layer and the dopant included in the second emission layer are identical to each other, the first compound and the second compound are different from each other, and an absolute value of the difference between
(Continued)

a HOMO energy level of the second hole-transporting compound and a HOMO energy level of the second compound is about 0.3 eV or less.

20 Claims, 2 Drawing Sheets

(51) Int. Cl.

| | |
|---|---|
| ***H10K 50/155*** | (2023.01) |
| ***H10K 50/165*** | (2023.01) |
| *H10K 101/40* | (2023.01) |

(56) References Cited

U.S. PATENT DOCUMENTS

| | | | | |
|---|---|---|---|---|
| 2007/0273270 | A1* | 11/2007 | Jinde | H10K 50/18 313/506 |
| 2011/0042663 | A1* | 2/2011 | Abe | H10K 85/623 585/27 |
| 2011/0215301 | A1 | 9/2011 | Forrest | |
| 2012/0104451 | A1* | 5/2012 | Kim | H10K 71/12 438/22 |
| 2018/0277772 | A1* | 9/2018 | Wu | H10K 50/82 |
| 2018/0294417 | A1* | 10/2018 | Pan | C07D 209/96 |
| 2019/0006590 | A1 | 1/2019 | Park et al. | |
| 2020/0274087 | A1 | 8/2020 | Lee et al. | |
| 2020/0287144 | A1 | 9/2020 | Hwang et al. | |
| 2021/0083205 | A1 | 3/2021 | Hwang et al. | |
| 2021/0104691 | A1 | 4/2021 | Lee et al. | |
| 2021/0159282 | A1 | 5/2021 | Jang et al. | |
| 2022/0077414 | A1 | 3/2022 | Lee et al. | |
| 2022/0416190 | A1 | 12/2022 | Zhang et al. | |
| 2023/0011568 | A1 | 1/2023 | Hwang et al. | |

FOREIGN PATENT DOCUMENTS

| | | | |
|---|---|---|---|
| KR | 1020160069625 | A | 6/2016 |
| KR | 1020170031362 | A | 3/2017 |
| KR | 101744248 | B1 | 6/2017 |
| KR | 1020200017985 | A | 2/2020 |
| KR | 102089329 | B1 | 3/2020 |
| KR | 20200103235 | A | 9/2020 |
| KR | 1020200107830 | A | 9/2020 |
| KR | 1020210031395 | A | 3/2021 |
| KR | 1020210036829 | A | 4/2021 |
| KR | 1020210144587 | A | 11/2021 |

OTHER PUBLICATIONS

English Abstract of KR 10-2020-0017985.

Extended European Search Report issued in EP Patent Application No. 21208148.3, dated Apr. 19, 2022, 10 pp.

Office Action dated Feb. 1, 2024, issued in corresponding EP Patent Application No. 21208148.3, 5 pp.

English Translation of Office Action dated Apr. 5, 2024, issued in corresponding KR Patent Application No. 10-2021-0155885, 6 pp.

Office Action dated Apr. 5, 2024, issued in corresponding KR Patent Application No. 10-2021-0155885, 7 pp.

* cited by examiner

LIGHT-EMITTING DEVICE AND ELECTRONIC APPARATUS INCLUDING THE SAME

CROSS-REFERENCE TO RELATED APPLICATION

This application claims priority under 35 U.S.C. § 119 to Korean Patent Application Nos. 10-2020-0156926, filed on Nov. 20, 2020, and 10-2021-0155885, filed on Nov. 12, 2021, in the Korean Intellectual Property Office, the content of which is incorporated by reference herein in its entirety.

BACKGROUND

1. Field

One or more embodiments relate to a light-emitting device and an electronic apparatus including the same.

2. Description of the Related Art

From among light-emitting devices, organic light-emitting devices are self-emission devices, which have improved characteristics in terms of viewing angles, response time, luminance, driving voltage, and response speed, and produce full-color images.

In an example, an organic light-emitting device includes an anode, a cathode, and an organic layer located between the anode and the cathode, wherein the organic layer includes an emission layer. A hole-transporting region may be located between the anode and the emission layer, and an electron-transporting region may be located between the emission layer and the cathode. Holes provided from the anode may move toward the emission layer through the hole-transporting region, and electrons provided from the cathode may move toward the emission layer through the electron-transporting region. The holes and the electrons recombine in the emission layer to produce excitons. These excitons transition from an excited state to a ground state to thereby generate light.

SUMMARY

One or more embodiments provide a light-emitting device having an emission layer and an electronic apparatus including the same.

Additional aspects will be set forth in part in the description, which follows and, in part, will be apparent from the description, or may be learned by practice of the presented embodiments of the disclosure.

According to one or more embodiments, a light-emitting device includes a first electrode, a second electrode facing the first electrode, an emission layer between the first electrode and the second electrode, the emission layer includes i) a first emission layer and ii) a second emission layer located between the first emission layer and the second electrode, the first emission layer is in direct contact with the second emission layer, the first emission layer includes a dopant, a first hole-transporting compound, and a first compound, the second emission layer includes a dopant, a second hole-transporting compound, and a second compound, the dopant included in the first emission layer and the dopant included in the second emission layer are identical to each other, the first compound and the second compound are different from each other, the absolute value of the difference between the highest occupied molecular orbital (HOMO) energy level of the second hole-transporting compound and the HOMO energy level of the second compound is 0.3 eV or less, and the HOMO energy level of the second hole-transporting compound and the HOMO energy level of the second compound are negative values measured by using a photoelectron spectroscopy in air.

According to one or more embodiments, an electronic apparatus includes the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
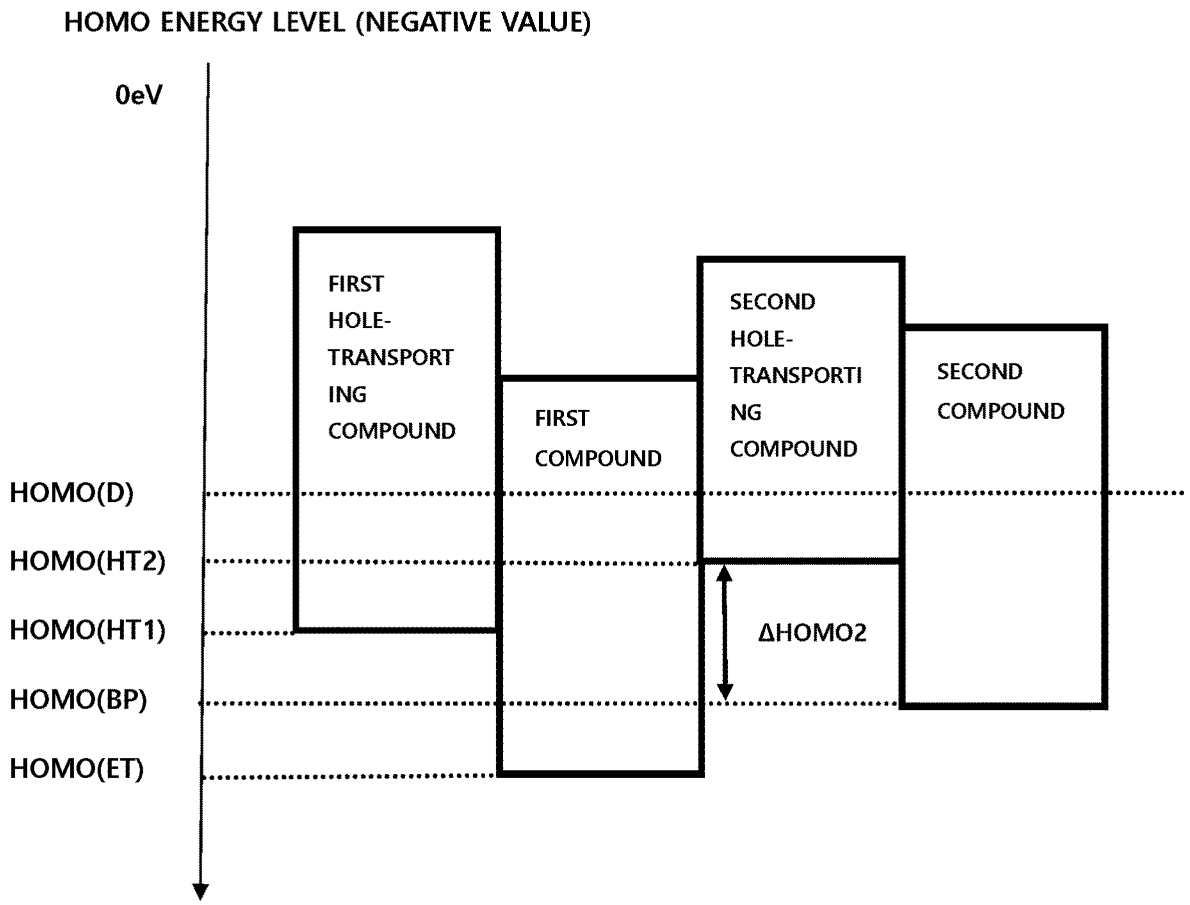
FIG. 1 shows an exemplary diagram illustrating a highest occupied molecular orbital (HOMO) energy level of first hole-transporting compound (HOMO(HT1)), a HOMO energy level of a first compound (HOMO(ET)), a HOMO energy level of a second hole-transporting compound (HOMO(HT2)), a HOMO energy level of a second compound (HOMO(BP)), and a HOMO energy level of a dopant (HOMO(D))

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects. As used herein, the term “and/or” includes any and all combinations of one or more of the associated listed items. Expressions such as “at least one of,” when preceding a list of elements, modify the entire list of elements and do not modify the individual elements of the list.

It will be understood that when an element is referred to as being “on” another element, it can be directly on the other element or intervening elements may be present therebetween In contrast, when an element is referred to as being “directly on” another element, there are no intervening elements present It will be understood that, although the terms “first,” “second,” “third” etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, “a first element,” “component,” “region,” “layer” or “section” discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

The light-emitting device may include: a first electrode; a second electrode facing the first electrode; and an emission layer located between the first electrode and the second electrode, wherein the emission layer may include i) a first emission layer; and ii) a second emission layer located between the first emission layer and the second electrode.

The first emission layer may be in direct contact with the second emission layer.

The first emission layer includes a dopant, a first hole-transporting compound, and a first compound, and the second emission layer includes a dopant, a second hole-transporting compound, and a second compound.

The dopant, the first hole-transporting compound, and the first compound included in the first emission layer may be different from each other.

The dopant, the second hole-transporting compound, and the second compound included in the second emission layer may be different from each other.

The total weight of the first hole-transporting compound and the first compound in the first emission layer may be greater than the weight of the dopant included in the first emission layer.

The total weight of the second hole-transporting compound and the second compound in the second emission layer may be greater than the weight of the dopant included in the second emission layer.

The dopant included in the first emission layer and the dopant included in the second emission layer may be identical to each other. The detailed description of the dopants is the same as described in the present specification.

In one or more embodiments, the dopant may be a phosphorescent dopant.

In one or more embodiments, the dopant may be a transition metal-containing organometallic compound.

In one or more embodiments, the dopant may be a transition metal-containing heteroleptic organometallic compound.

In one or more embodiments, the dopant may be an organometallic compound represented by Formula 1. Formula 1 will be described in detail later.

In one or more embodiments, the dopant includes a transition metal-containing organometallic compound, wherein the transition metal-containing organometallic compound includes a pyridine group, a benzimidazole group (or a naphthimidazole group), and a dibenzofuran group (or azadibenzofuran group, a dibenzothiophene group, or an azadibenzothiophene group), each of the pyridine group and the benzimidazole group (or a naphthimidazole group) may be attached to the transition metal of the transition metal-containing organometallic compound via nitrogen, and the dibenzofuran group (or azadibenzofuran group, a dibenzothiophene group, or an azadibenzothiophene group) may be attached to the transition metal of the transition metal-containing organometallic compound via carbon. The pyridine group, the benzimidazole group (or a naphthimidazole group), and the dibenzofuran group (or an azadibenzofuran group, a dibenzothiophene group, or an azadibenzothiophene group) may be optionally substituted with at least one $R_1$. $R_1$ is the same as described in connection with Formula 1.

In one or more embodiments, the dopant may be a transition metal-containing organometallic compound, and the transition metal-containing organometallic compound may include a group represented by $-Si(Q_3)(Q_4)(Q_5)$, a group represented by $-Ge(Q_3)(Q_4)(Q_5)$, or any combination thereof. —$Si(Q_3)(Q_4)(Q_5)$ and —$Ge(Q_3)(Q_4)(Q_5)$ are the same as described in connection with Formula 1.

Each of the first hole-transporting compound and the second hole-transporting compound may include at least one n electron rich $C_3$-$C_{60}$ cyclic group (for example, π electron rich $C_6$-$C_{60}$ cyclic group, such as a carbazole group, an indolocarbazole group, a benzene group, etc.) and may not include an electron-transporting group. Examples of the electron-transporting group include a cyano group, a fluoro group, a π electron-deficient nitrogen-containing $C_1$-$C_{60}$ cyclic group (for example, a π electron-deficient nitrogen-containing $C_5$-$C_{60}$ cyclic group), a phosphine oxide group, and a sulfoxide group.

In one or more embodiments, the first hole-transporting compound and the second hole-transporting compound may each be a compound represented by Formula 5. Formula 5 will be described in detail later.

In one or more embodiments, the first hole-transporting compound and the second hole-transporting compound may be different from each other.

In one or more embodiments, the first hole-transporting compound and the second hole-transporting compound may be identical to each other.

The first compound included in the first emission layer and the second compound included in the second emission layer may be different from each other.

In one or more embodiments, the first compound may be an electron-transporting compound. For example, the first compound may be a compound containing at least one electron-transporting group. The electron-transporting group may be a cyano group, a fluoro group, a π electron-deficient nitrogen-containing $C_1$-$C_{60}$ cyclic group, a phosphine oxide group, a sulfoxide group, or a combination thereof.

In one or more embodiments, the first compound may be a compound represented by Formula 7. Formula 7 will be described in detail later.

The absolute value of the difference between the highest occupied molecular orbital (HOMO) energy level of the second hole-transporting compound included in the second emission layer and the HOMO energy level of the second compound included in the second emission layer may be about 0.3 eV or less. The second compound included in the second emission layer may be any compound that satisfies the absolute value relationship of the difference in HOMO energy levels as described above.

In one or more embodiments, the second compound may be a bipolar compound.

In one or more embodiments, the second compound may be a compound represented by Formula 9 below. Formula 9 is the same as described in the present specification.

The "HOMO energy level" is a found value measured by using a photoelectron spectroscopy in air, and is a negative value.

Hereinafter, the HOMO energy level relationship among the dopant, the first hole-transporting compound, the first compound, the second hole-transporting compound and the second compound will be described with reference to FIG. 1.

FIG. 1 shows an example of a diagram illustrating a highest occupied molecular orbital (HOMO) energy level of first hole-transporting compound (HOMO(HT1)), a HOMO energy level of a first compound (HOMO(ET)), a HOMO energy level of a second hole-transporting compound (HOMO(HT2)), a HOMO energy level of a second compound (HOMO(BP)), and a HOMO energy level of a dopant (HOMO(D)).

The "HOMO energy level" illustrated in FIG. 1 is a found value obtained by measuring by using a photoelectron spectroscopy in air, and is a negative value.

The HOMO energy level of the first hole-transporting compound (HOMO(HT1)) may be smaller than the HOMO energy level of the second hole-transporting compound (HOMO(HT2)).

The minimum value from among the HOMO energy level of the first hole-transporting compound (HOMO(HT1)) and the HOMO energy level of the second hole-transporting compound (HOMO(HT2)) may be about −5.80 eV or more.

For example, the minimum value from among the HOMO energy level of the first hole-transporting compound (HOMO (HT1)) and the HOMO energy level of the second hole-transporting compound (HOMO (HT2)) may be about −5.80 eV or more, from about −5.80 eV to about −5.30 eV, from about −5.80 eV to about −5.40 eV, from about −5.70 eV to about −5.20 eV, from about −5.65 eV to about −5.20 eV, from about −5.70 eV to about −5.30 eV, from about −5.70 eV to about −5.40 eV, or from about −5.65 eV to about −5.45 eV.

In one or more embodiments, the HOMO energy level of the first hole-transporting compound (HOMO(HT1)) and the HOMO energy level of the second hole-transporting compound (HOMO(HT2)) may each be about −5.80 eV or more.

For example, the HOMO energy level of the first hole-transporting compound (HOMO(HT1)) and the HOMO energy level of the second hole-transporting compound (HOMO(HT2)) may each be about −5.80 eV or more, from about −5.80 eV to about −5.30 eV, from about −5.80 eV to about −5.40 eV, from about −5.70 eV to about −5.20 eV, from about −5.65 eV to about −5.20 eV, from about −5.70 eV to about −5.30 eV, from about −5.70 eV to about −5.40 eV, or from about −5.65 eV to about −5.45 eV.

The HOMO energy level of the first compound (HOMO (ET)) may be smaller than the HOMO energy level of the second compound (HOMO(BP)).

For example, the HOMO energy level of the first compound (HOMO(ET)) and the HOMO energy level of the second compound (HOMO(BP)) may be about −6.15 eV or more, or about −6.08 eV or more, respectively.

In one or more embodiments, the HOMO energy level of the second compound (HOMO(BP)) may be about −6.00 eV or more, about −5.90 eV or more, or about −5.80 eV or more.

The absolute value of the difference (ΔHOMO2) between the HOMO energy level of the second hole-transporting compound (HOMO(HT2)) and the HOMO energy level of the second compound (HOMO(BP)) may be about 0.30 eV or less, about 0.20 eV or less, about 0.16 eV or less, from about 0.001 eV to about 0.30 eV, from about 0.001 eV to about 0.20 eV, from about 0.001 eV to about 0.16 eV, from about 0.01 eV to about 0.20 eV, from about 0.01 eV to about 0.16 eV, from about 0.02 eV to about 0.16 eV, from about 0.03 eV to about 0.16 eV, from about 0.04 eV to about 0.16 eV, from about 0.05 eV to about 0.16 eV, from about 0.06 eV to about 0.16 eV, from about 0.07 eV to about 0.16 eV, from about 0.08 eV to about 0.16 eV, or from about 0.09 eV to about 0.16 eV.

The maximum value from among the HOMO energy level of the first hole-transporting compound (HOMO(HT1)), the HOMO energy level of the first compound (HOMO(ET)), the HOMO energy level of the second hole-transporting compound (HOMO(HT2)), and the HOMO energy level of the second compound (HOMO(BP)) may be smaller than the HOMO energy level of the dopant (HOMO(D)).

For example, the HOMO energy level of the dopant (HOMO(D)) may be from about −5.60 eV to about −5.20 eV, for ex ample, about −5.50 eV to about −5.25 eV.

In one or more embodiments, the first hole-transporting compound and the second hole-transporting compound may be different from each other, and may satisfy the condition of, as illustrated in FIG. 1, HOMO(D)>HOMO(HT2)>HOMO(HT1)>HOMO(BP)>HOMO (ET).

In the light-emitting device including the emission layer including the first emission layer and the second emission layer as described above, hole mobility in the second emission layer is improved, the electrical resistance of the emission layer is lowered when the light-emitting device is driven, and the exciton distribution into the second emission layer may be enlarged. Accordingly, the light-emitting device may have excellent characteristics in terms of driving voltage, luminescence efficiency, roll-off ratio and/or lifespan.

In one or more embodiments, in the second emission layer, the weight of the second compound may be the same as the weight of the second hole-transporting compound. In one or more embodiments, in the second emission layer, the weight of the second compound in the second emission layer may be greater than the weight of the second hole-transporting compound. In one or more embodiments, in the second emission layer, the weight of the second compound in the second emission layer may be less than the weight of the second hole-transporting compound. In one or more embodiments, in the second emission layer, the weight ratio of the second hole-transporting compound to the second compound may be from 2:8 to 8:2, for example, 3:7 to 7:3, or 4:6 to 6:4, or 5:5.

In one or more embodiments, the thickness of the second emission layer may be the same as the thickness of the first emission layer.

In one or more embodiments, the thickness of the second emission layer may be greater than the thickness of the first emission layer.

In one or more embodiments, the light emitted from the emission layer to the outside through at least one of the first electrode and the second electrode may not be white light.

In one or more embodiments, the light emitted from the emission layer to the outside through at least one of the first electrode and the second electrode may be green light having a maximum emission wavelength of about 500 nm to about 580 nm.

In one or more embodiments, the light-emitting device may further include a hole-transporting region located between the first electrode and the emission layer, and the hole-transporting region may not include a charge-generation layer or an emission layer. The hole-transporting region may include a hole injection layer, a hole-transporting layer, an electron-blocking layer, a buffer layer, or a combination thereof.

In one or more embodiments, the light-emitting device may further include an electron-transporting region located between the emission layer and the second electrode, and the electron-transporting region may not include a charge-generation layer and an emission layer. The electron-transporting region may include a hole-blocking layer, an electron-transporting layer, an electron injection layer, or any combination thereof.

In one or more embodiments, the emission layer may not include compounds of Group A:

Group A

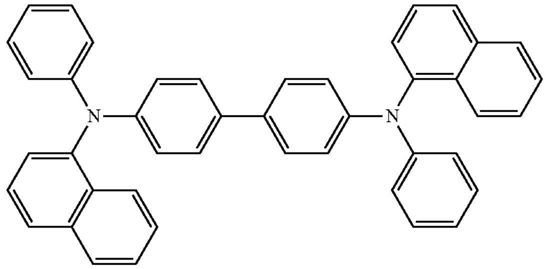

NPB

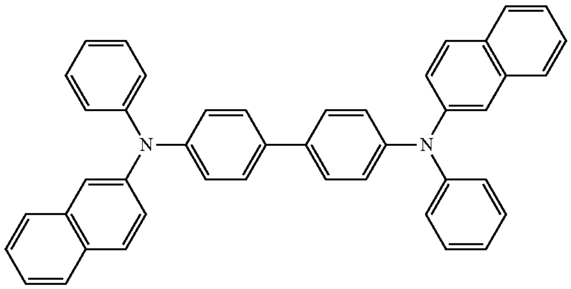

β-NPB

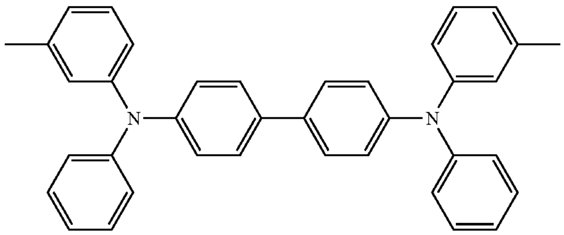

TPD

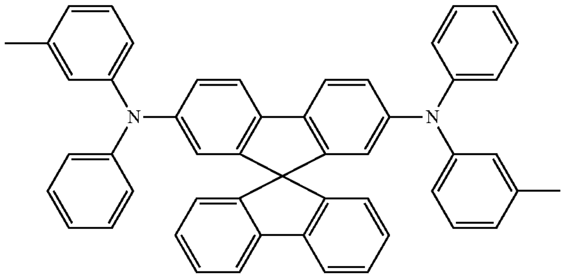

Spiro-TPD

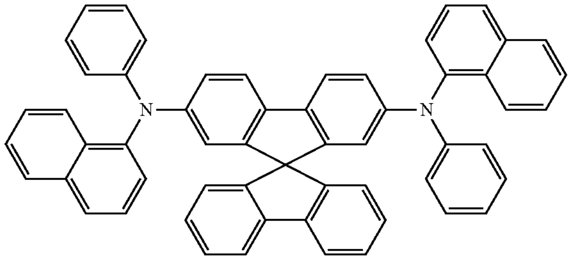

Spiro-NPB

-continued
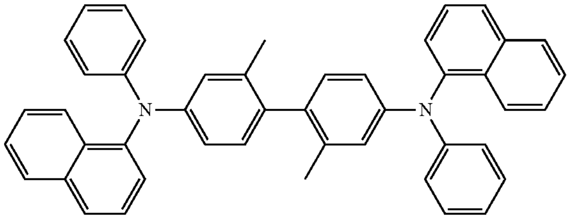
methylated NPB
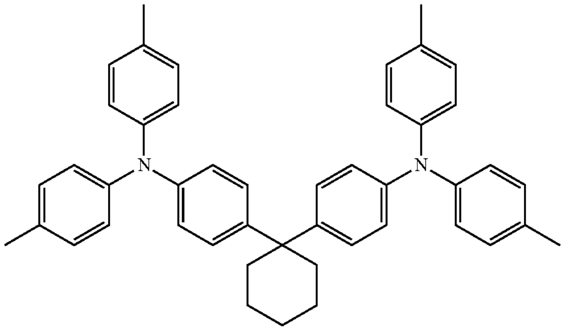
TAPC
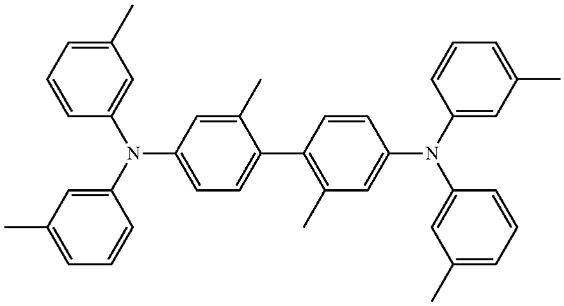
HMTPD
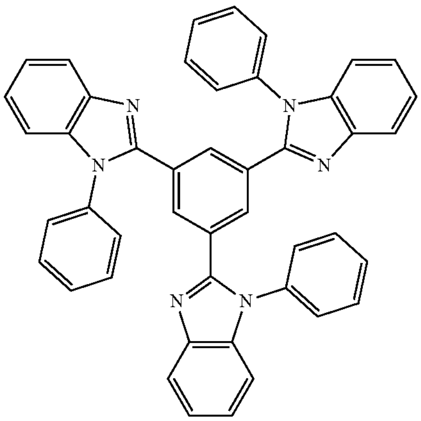
TPBi
-continued
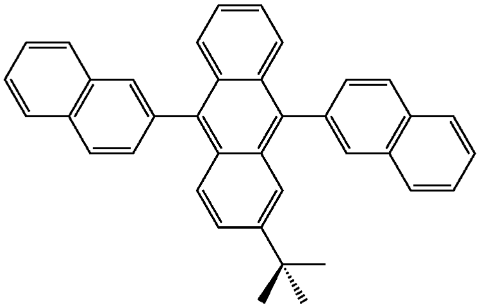
TBADN
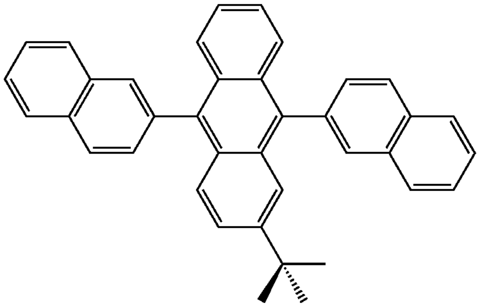
ADN
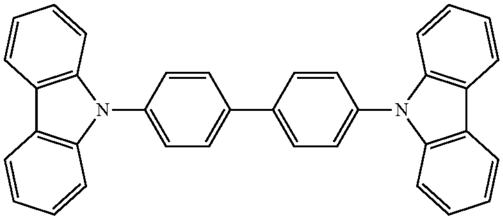
CBP
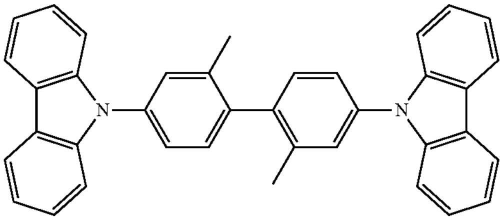
CDBP
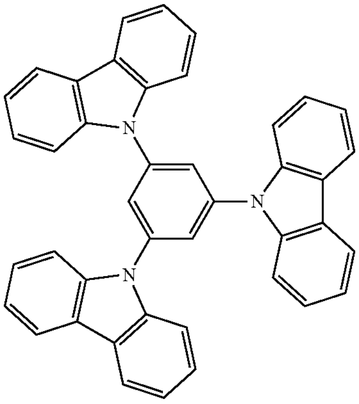
TCP -continued
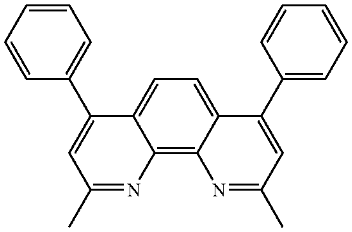
BCP
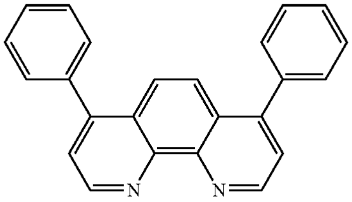
Bphen
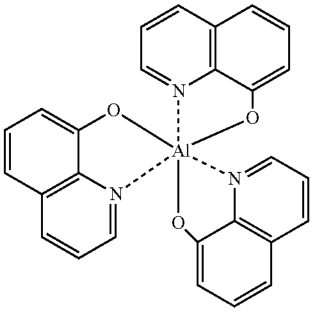
Alq3
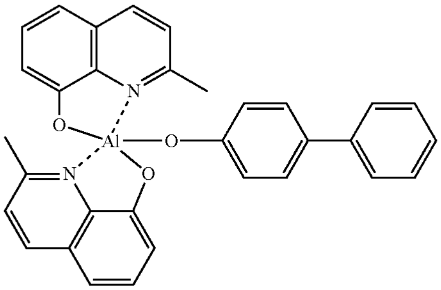
BAlq
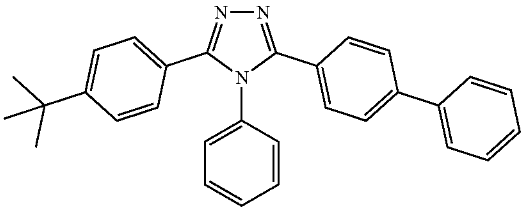
TAZ
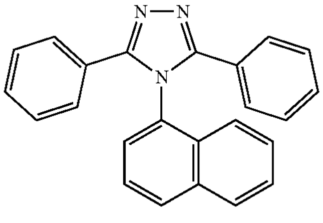
NTAZ
-continued
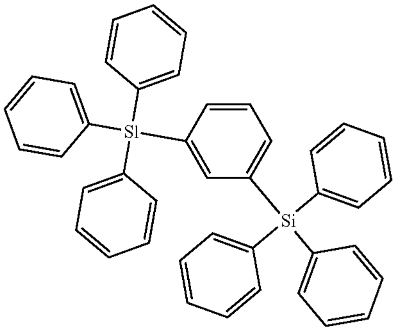
m-bis-(triphenylsilyl)benzene
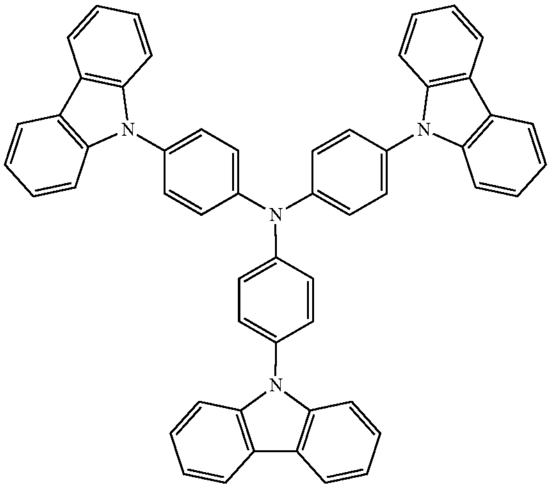
TCTA(4,4′,4″-tris(carbazol-9-yl)triphenylfamine)
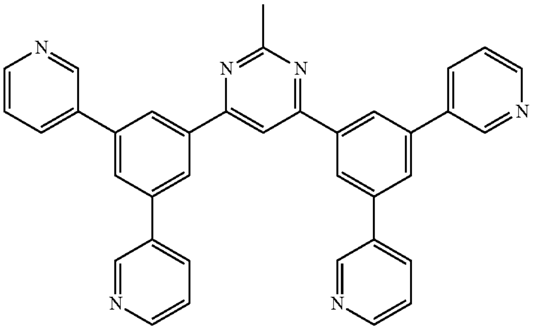
B3PYMPM(4,6-bis(3,5-di(pyridine-3-yl)phenyl)-2-methylpyrimidine)
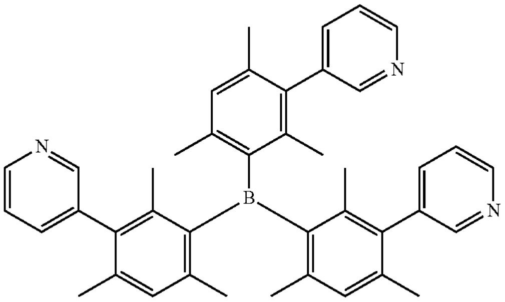
3TPYMB(tris(2,4,6-trimethyl-3-(pyridine-3-yl)phenyl)borane)

-continued

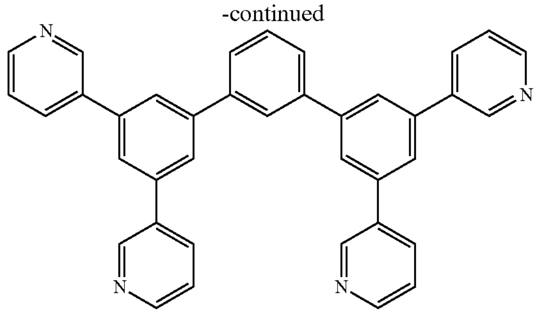

BmPyPhB(1,3-bis[3,5-di(pyridine-3-yl)phenyl]benzene)

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

Description of Formula 1

Formula 1 is shown below.

$M(L_1)_{n1}(L_2)_{n2}$

M in Formula 1 may be a transition metal.

For example, M may be a Period 1 transition metal, a Period 2 transition metal, or a Period 3 transition metal of the Periodic Table of Elements.

In one or more embodiments, M may be iridium (Ir), platinum (Pt), osmium (Os), titanium (Ti), zirconium (Zr), hafnium (Hf), europium (Eu), terbium (Tb), thulium (Tm)), or rhodium (Rh).

In one or more embodiments, M may be Ir, Pt, Os, or Rh.

In Formula 1, $L_1$ may be a ligand represented by Formula 2A, and $L_2$ may be a ligand represented by Formula 2B:

<Formula 2A>

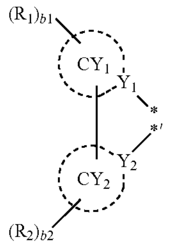

<Formula 2B>

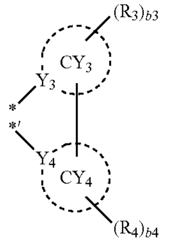

Formulae 2A and 2B are the same as described in the present specification.

n1 in Formula 1 may be 1, 2, or 3, wherein, when n1 is 2 or more, two or more of $L_1$(s) may be identical to or different from each other.

n2 in Formula 1 may be 0, 1, or 2, wherein, when n2 is 2, two $L_2$(s) may be identical to or different from each other.

The sum of n1 and n2 in Formula 1 may be 2 or 3. For example, the sum of the n1 and n2 may be 3.

In one or more embodiments, in Formula 1, i) M may be Ir, and the sum of n1 and n2 may be 3; or ii) M may be Pt, and the sum of n1 and n2 may be 2.

In one or more embodiments, in Formula 1, M may be Ir, and i) n1 may be 1 and n2 may be 2, or ii) n1 may be 2 and n2 may be 1.

$L_1$ and $L_2$ in Formula 1 may be different from each other.

$Y_1$ to $Y_4$ in Formulae 2A to 2B may be each independently be C or N. For example, $Y_1$ and $Y_3$ may each be N, and $Y_2$ and $Y_4$ may each be C.

Ring $CY_1$ to ring $CY_4$ in Formulae 2A and 2B may each independently be a $C_5$-$C_{30}$ carbocyclic group or a $C_1$-$C_{30}$ heterocyclic group.

For example, ring $CY_1$ to ring $CY_4$ may each independently be, i) a third ring, ii) a fourth ring, iii) a condensed ring in which two or more third rings are condensed with each other, iv) a condensed ring in which two or more fourth rings are condensed with each other, or v) a condensed ring in which one or more third rings and one or more fourth rings are condensed with each other, the third ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the fourth ring may be an adamantane group, a norbornane group, a norbornene group, a cyclohexane group, a cyclohexene group, a benzene group, a pyridine group, a pyrimidine group, a pyrazine group, a pyridazine group, or a triazine group.

In one or more embodiments, ring $CY_1$ to ring $CY_4$ may each independently be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a pyrrole group, a furan group, a thiophene group, a silole group, a borole group, a phosphole group, a germole group, a selenophene group, an indene group, an indole group, a benzofuran group, a benzothiophene group, a benzosilole group, a benzoborole group, a benzophosphole group, a benzogermole group, a benzoselenophene group, a fluorene group, a carbazole group, a dibenzofuran group, a dibenzothiophene group, a dibenzosilole group, a dibenzoborole group, a dibenzophosphole group, a dibenzogermole group, a dibenzoselenophene group, a benzofluorene group, a benzocarbazole group, a naphthobenzofuran group, a naphthobenzothiophene group, a naphthobenzosilole group, a naphthobenzoborole group, a naphthobenzophosphole group, a naphthobenzogermole group, a naphthobenzoselenophene group, a dibenzofluorene group, a dibenzocarbazole group, a dinaphthofuran group, a dinaphthothiophene group, a dinaphthosilole group, a dinaphthoborole group, a dinaphthophosphole group, a dinaphthogermole group, a dinaphthoselenophene group, an indenophenanthrene group, an indolophenanthrene group, a phenanthrobenzofuran group, a phenanthrobenzothiophene group, a phenanthrobenzosilole group, a phenanthrobenzoborole group, a phenanthrobenzophosphole group, a phenanthrobenzogermole group, a phenanthrobenzoselenophene group, a dibenzothiophene 5-oxide group, a 9H-fluorene-9-one group, a dibenzothiophene 5,5-dioxide group, an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a pyrrole group, a pyrazole group, an imidazole group, a triazole group, an oxazole group, an isooxazole group, a thiazole group, an isothiazole group, an oxadiazole group, a thiadiazole group, an azasilole group, an azaborole group, an azaphosphole group, an azagermole group, an azaselenophene group, a benzopyrrole group, a benzopyrazole group, a benzimidazole group, a benzoxazole group, a benzisoxazole group, a benzothiazole group, a benzisothiazole group, a benzoxadiazole group, a benzothiadiazole group, a pyridinopyrrole group, a pyridinopyrazole group, a pyridinoimidazole group, a pyridinooxazole group, a pyridinoisoxazole group, a pyridinothiazole group, a pyridinoisothiazole group, a pyridinooxadiazole group, a pyridinothiadiazole group, a pyrimidinopyrrole group, a pyrimidinopyrazole group, a pyrimidinoimidazole group, a pyrimidinooxazole group, a pyrimidinoisoxazole group, a pyrimidinothiazole group, a pyrimidinoisothiazole group, a pyrimidinooxadiazole group, a pyrimidinothiadiazole group, a 5,6,7,8-tetrahydroisoquinoline group, a 5,6,7,8-tetrahydroquinoline group, an adamantane group, a norbornane group, a norbornene group, a benzene group condensed with a cyclohexane group, a benzene group condensed with a norbornane group, a pyridine group condensed with a cyclohexane group, or a pyridine group condensed with a norbornane group.

In one or more embodiments, ring $CY_1$ may be an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrene benzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a pyrrole group, a pyrazole group, an imidazole group, a triazole group, an oxazole group, an isooxazole group, a thiazole group, an isothiazole group, an oxadiazole group, a thiadiazole group, an azasilole group, an azaborole group, an azaphosphole group, an azagermole group, an azaselenophene group, a benzopyrrole group, a benzopyrazole group, a benzimidazole group, a benzoxazole group, a benzisoxazole group, a benzothiazole group, a benzisothiazole group, a benzoxadiazole group, a benzothiadiazole group, a pyridinopyrrole group, a pyridinopyrazole group, a pyridinoimidazole group, a pyridinooxazole group, a pyridinoisoxazole group, a pyridinothiazole group, a pyridinoisothiazole group, a pyridinooxadiazole group, a pyridinothiadiazole group, a pyrimidinopyrrole group, a pyrimidinopyrazole group, a pyrimidinoimidazole group, a pyrimidinooxazole group, a pyrimidinoisoxazole group, a pyrimidinothiazole group, a pyrimidinoisothiazole group, a pyrimidinooxadiazole group, a pyrimidinothiadiazole group, a 5,6,7,8-tetrahydroisoquinoline group, a 5,6,7,8-tetrahydroquinoline group, a pyridine group condensed with a cyclohexane group, or a pyridine group condensed with a norbornane group.

In one or more embodiments, ring $CY_2$ and $CY_4$ may each independently be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a pyrrole group, a furan group, a thiophene group, a silole group, a borole group, a phosphole group, a germole group, a selenophene group, an indene group, an indole group, a benzofuran group, a benzothiophene group, a benzosilole group, a benzoborole group, a benzophosphole group, a benzogermole group, a benzoselenophene group, a fluorene group, a carbazole group, a dibenzofuran group, a dibenzothiophene group, a dibenzosilole group, a dibenzoborole group, a dibenzophosphole group, a dibenzogermole group, a dibenzoselenophene group, a benzofluorene group, a benzocarbazole group, a naphthobenzofuran group, a naphthobenzothiophene group, a naphthobenzosilole group, a naphthobenzoborole group, a naphthobenzophosphole group, a naphthobenzogermole group, a naphthobenzoselenophene group, a dibenzofluorene group, a dibenzocarbazole group, a dinaphthofuran group, a dinaphthothiophene group, a dinaphthosilole group, a dinaphthoborole group, a dinaphthophosphole group, a dinaphthogermole group, a dinaphthoselenophene group, an indenophenanthrene group, an indolophenanthrene group, a phenanthrobenzofuran group, a phenanthrobenzothiophene group, a phenanthrobenzosilole group, a phenanthrobenzoborole group, a phenanthrobenzophosphole group, a phenanthrobenzogermole group, a phenanthrobenzoselenophene group, a dibenzothiophene 5-oxide group, a 9H-fluorene-9-one group, a dibenzothiophene 5,5-dioxide group, an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluorene-9-one group, an azadibenzothiophene 5,5-dioxide group, a pyridine group, an adamantane group, a norbornane group, a norbornene group, a benzene group condensed with a cyclohexane group, or a benzene group condensed with a norbornane group.

In one or more embodiments, ring $CY_3$ may be an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a 5,6,7,8-tetrahydroquinoline group, a pyridine group condensed with a cyclohexane group, or a pyridine group condensed with a norbornane group.

In one or more embodiments, ring $CY_1$ of Formula 2A may be a pyridine group, a benzimidazole group, a pyridinoimidazole group, or a pyrimidinoimidazole group.

In one or more embodiments, ring $CY_2$ in Formula 2A may be a fluorene group, a carbazole group, a dibenzofuran group, a dibenzothiophene group, a dibenzosilole group, a dibenzoborole group, a dibenzophosphole group, a dibenzogermole group, a dibenzoselenophene group, a benzofluorene group, a benzocarbazole group, a naphthobenzofuran group, a naphthobenzothiophene group, a naphthobenzosilole group, a naphthobenzoborole group, a naphthobenzophosphole group, a naphthobenzogermole group, a naphthobenzoselenophene group, a dibenzofluorene group, a dibenzocarbazole group, a dinaphthofuran group, a dinaphthothiophene group, a dinaphthosilole group, a dinaphthoborole group, a dinaphthophosphole group, a dinaphthogermole group, a dinaphthoselenophene group, an indenophenanthrene group, an indolophenanthrene group, a phenanthrobenzofuran group, a phenanthrobenzothiophene group, a phenanthrobenzosilole group, a phenanthrobenzoborole group, a phenanthrobenzophosphole group, a phenanthrobenzogermole group, a phenanthrobenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, or an azaphenanthrobenzoselenophene group.

In one or more embodiments, ring $CY_3$ of Formula 2B may be a pyridine group, a pyrimidine group, a pyrazine group, a pyridazine group, a triazine group, a 5,6,7,8-tetrahydroquinoline group, a pyridine group condensed with a cyclohexane group, or a pyridine group condensed with a norbornane group.

In one or more embodiments, ring $CY_4$ of Formula 2B may be a benzene group, a naphthalene group, an anthracene group, a phenanthrene group, a triphenylene group, a pyrene group, a chrysene group, a 1,2,3,4-tetrahydronaphthalene group, a benzene group condensed with a cyclohexane group, or a benzene group condensed with a norbornane group.

For example, ring $CY_1$ and ring $CY_3$ in Formulae 2A and 2B may be different from each other.

In one or more embodiments, ring $CY_2$ and ring $CY_4$ in Formulae 2A and 2B may be different from each other.

In one or more embodiments, ring CY, to ring $CY_4$ may be different from each other.

$R_1$ to $R_4$ in Formulae 2A and 2B may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$. $Q_1$ to $Q_9$ are the same as described in the present specification.

In one or more embodiments, $R_1$ to $R_4$ in Formulae 2A and 2B may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_2$ alkoxy group, or a $C_1$-$C_{20}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl) phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl) a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group or azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$alkyl group, a (phenyl)$C_1$-$C_{10}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$ or $—P(Q_8)(Q_9)$, wherein $Q_1$ to $Q_9$ are each independently:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

In one or more embodiments, $R_1$ to $R_4$ may each independently be:

hydrogen, deuterium, —F, or a cyano group;

a $C_1$-$C_{20}$ alkyl group unsubstituted or substituted with deuterium, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a fluorinated a phenyl group, a ($C_1$-$C_{20}$ alkyl)phenyl group, a biphenyl group, a deuterated a biphenyl group, a fluorinated a biphenyl group, a ($C_1$-$C_{20}$ alkyl)biphenyl group, a dibenzofuranyl group, a deuterated a dibenzofuranyl group, a fluorinated a dibenzofuranyl group, a ($C_1$-$C_{20}$ alkyl)dibenzofuranyl group, a dibenzothiophenyl group, a deuterated a dibenzothiophenyl group, a fluorinated a dibenzothiophenyl group, a ($C_1$-$C_{20}$ alkyl)dibenzothiophenyl group, or any combination thereof;

a $C_3$-$C_{10}$ cycloalkyl group, a $C_1$-$C_{10}$ heterocycloalkyl group, a phenyl group, or a biphenyl group, each unsubstituted or substituted with deuterium, a cyano group, a $C_1$-$C_{20}$ alkyl group, a deuterated $C_1$-$C_{20}$ alkyl group, fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated a phenyl group, a ($C_1$-$C_{20}$ alkyl)phenyl group, a biphenyl group, a deuterated biphenyl group, a fluorinated a biphenyl group, a ($C_1$-$C_{20}$ alkyl)biphenyl group, a dibenzofuranyl group, a deuterated dibenzofuranyl group, a fluorinated a dibenzofuranyl group, a ($C_1$-$C_{20}$ alkyl)dibenzofuranyl group, a dibenzothiophenyl group, a deuterated dibenzothiophenyl group, a fluorinated a dibenzothiophenyl group, a ($C_1$-$C_{20}$ alkyl)dibenzothiophenyl group, or any combination thereof; or $—Si(Q_3)(Q_4)(Q_5)$ or $—Ge(Q_3)(Q_4)(Q_5)$.

b1 to b4 in Formula 2A and 2B indicate the numbers of $R_1$ to $R_4$, respectively, and may each independently be an integer from 0 to 20. When b1 is 2 or more, two or more of $R_1$(s) may be identical to or different from each other, when b2 is 2 or more, two or more of $R_2$(s) may be identical to or different from each other, when b3 is 2 or more, two or more of $R_3$(s) may be identical to or different from each other, and when b4 is 2 or more, two or more of $R_4$(s) may be identical to or different from each other. For example, b1 to b4 may each independently be an integer from 0 to 8.

In one or more embodiments, n2 in Formula 1 may not be 0, b3 of Formula 2B may not be 0, and at least one of $R_3$(s) in the number of b3 may be $—Si(Q_3)(Q_4)(Q_5)$ or $—Ge(Q_3)(Q_4)(Q_5)$. $Q_3$ to $Q_5$ are the same as described in the present specification.

For example, $Q_3$ to $Q_5$ may each independently be:

a $C_1$-$C_{60}$ alkyl group unsubstituted or substituted with deuterium, a $C_1$-$C_{60}$ alkyl group, a $C_6$-$C_{60}$ aryl group, or any combination thereof; or a $C_6$-$C_{60}$ aryl group unsubstituted or substituted with deuterium, a $C_1$-$C_{60}$ alkyl group, a $C_6$-$C_{60}$ aryl group, or any combination thereof.

In one or more embodiments, $Q_3$ to $Q_5$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

In one or more embodiments, $Q_3$ to $Q_5$ may be identical to each other.

In one or more embodiments, two or more of $Q_3$ to $Q_5$ may be different from each other.

In one or more embodiments, the organometallic compound represented by Formula 1 may include at least one deuterium.

In one or more embodiments, the organometallic compound represented by Formula 1 may satisfy at least one of Condition (1) to Condition (8):

Condition (1)

b1 in Formula 2A is not 0, and at least one of $R_1$(s) in the number of b1 includes deuterium.

Condition (2)

b2 in Formula 2A is not 0, and at least one of $R_2$(s) in the number of b2 includes deuterium.

Condition (3)

b3 in Formula 2B is not 0, and at least one of $R_3$(s) in the number of b3 includes deuterium.

Condition (4)

b4 in Formula 2B is not 0, and at least one of $R_4$(s) in the number of b4 includes deuterium.

Condition (5)

b1 in Formula 2A is not 0, and at least one of $R_1$(s) in the number of b1 includes a fluoro group.

Condition (6)

b2 in Formula 2A is not 0, and at least one of $R_2$(s) in the number of b2 includes a fluoro group.

Condition (7)

b3 in Formula 2B is not 0, and at least one of $R_3$(s) in the number of b3 includes a fluoro group.

Condition (8)

b4 in Formula 2B is not 0, and at least one of $R_4$(s) in the number of b4 includes a fluoro group In one or more embodiments, $R_1$ to $R_4$ in Formulae 2A and 2B may each independently be hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, $—OCH_3$, $—OCDH_2$, $—OCD_2H$, $—OCD_3$, $—SCH_3$, $—SCDH_2$, $—SCD_2H$, $—SCD_3$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-230, a group represented by one of Formulae 9-201 to 9-230 in which at least one hydrogen is substituted with deuterium, a group represented by one of Formulae 9-201 to 9-230 in which at least one hydrogen is substituted with —F, a group represented by one of Formulae 10-1 to 10-145, a group represented by one of Formulae 10-1 to 10-145 in which at least one hydrogen is substituted with deuterium, a group represented by one of Formulae 10-1 to 10-145 in which at least one hydrogen is substituted with —F, a group represented by one of Formulae 10-201 to 10-354, a group represented by one of Formulae 10-201 to 10-354 in which at least one hydrogen is substituted with deuterium, a group represented by one of Formulae 10-201 to 10-354 in which at least one hydrogen is substituted with —F, $—Si(Q_3)(Q_4)(Q_5)$ or $—Ge(Q_3)(Q_4)(Q_5)$(where $Q_3$ to $Q_5$ are the same as described in the present specification):

9-1

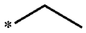

9-2

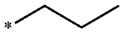

9-3

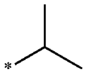

9-4

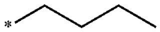

9-5

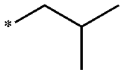

9-6

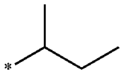

9-7

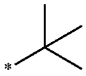

9-8

9-9

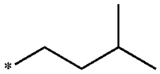

-continued 9-10

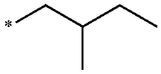

9-11

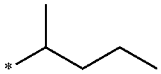

9-12

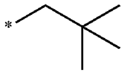

9-13

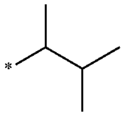

9-14

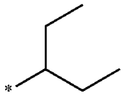

9-15

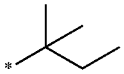

9-16

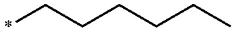

9-17

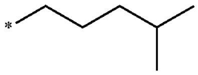

9-18

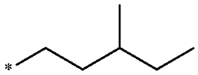

9-19

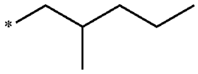

9-20

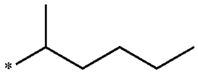

9-21

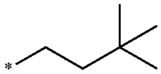

9-22

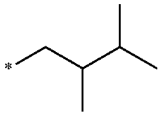

9-23

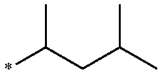

9-24

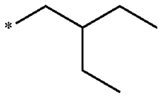

9-25

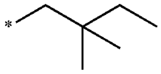

-continued
9-26
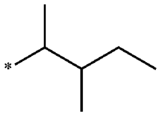
9-27
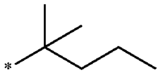
9-28
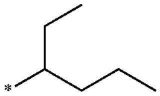
9-29
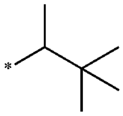
9-30
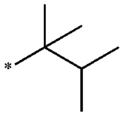
9-31
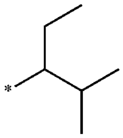
9-32
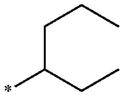
9-33
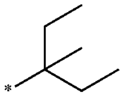
9-34
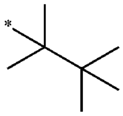
9-35
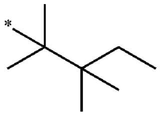
9-36
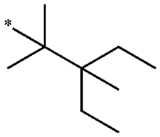
9-37
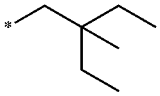
9-38
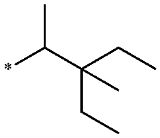
-continued
9-39
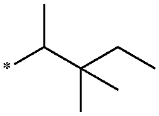
9-201
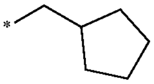
9-202
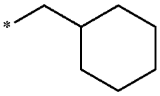
9-203
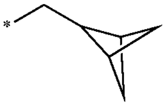
9-204
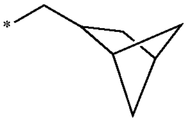
9-205
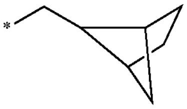
9-206
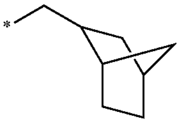
9-207
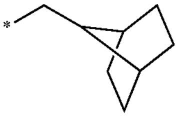
9-208
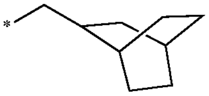
9-209
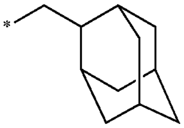
9-210
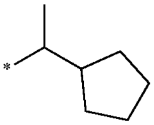
9-211
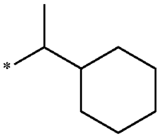

-continued
9-212
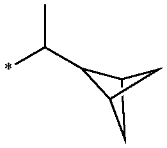
9-213
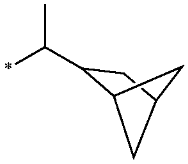
9-214
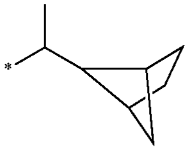
9-215
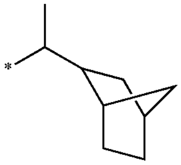
9-216
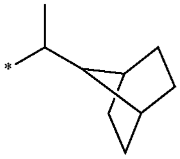
9-217
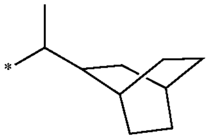
9-218
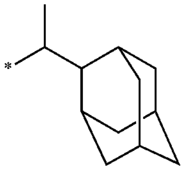
9-219
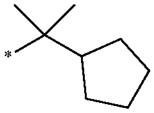
9-220
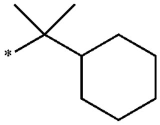
9-221
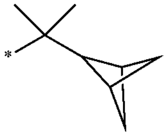
-continued
9-222
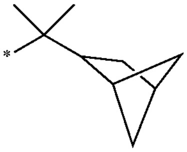
9-223
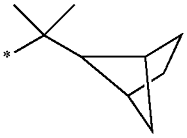
9-224
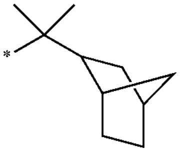
9-225
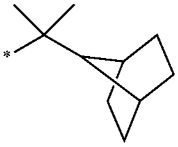
9-226
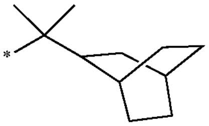
9-227
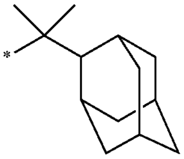
9-228
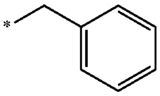
9-229
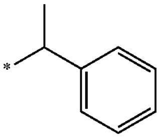
9-230
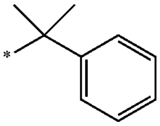
10-1
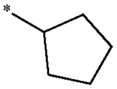
10-2
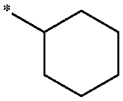

-continued
10-3
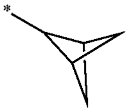
10-4
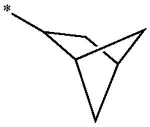
10-5
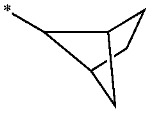
10-6
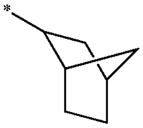
10-7
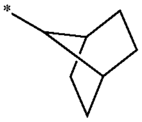
10-8
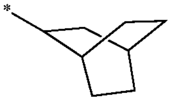
10-9
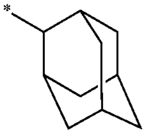
10-10
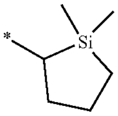
10-11
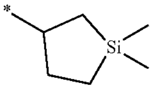
10-12
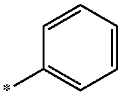
10-13
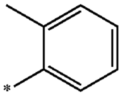
10-14
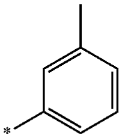
-continued
10-15
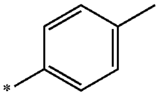
10-16
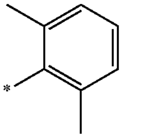
10-17
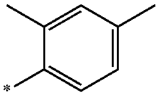
10-18
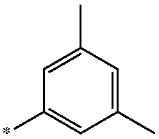
10-19
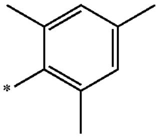
10-20
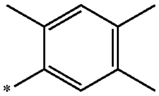
10-21
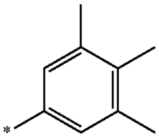
10-22
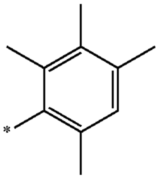
10-23
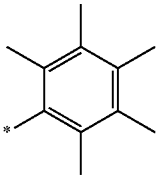
10-24
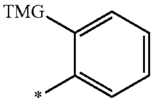
10-25
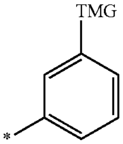

-continued
10-26
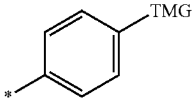
10-27
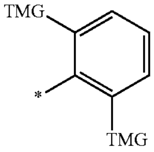
10-28
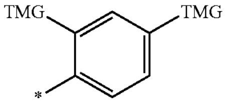
10-29
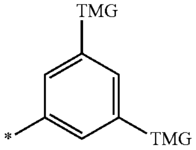
10-30
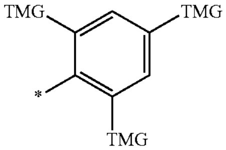
10-31
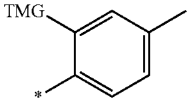
10-32
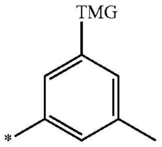
10-33
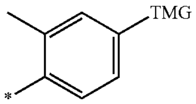
10-34
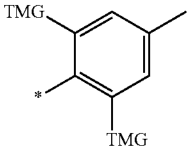
10-35
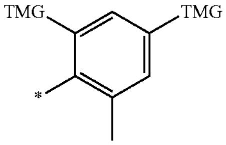
10-36
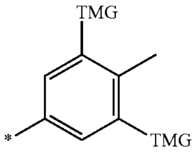
-continued
10-37
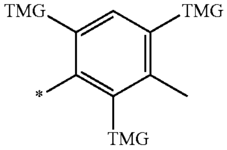
10-38
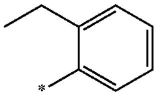
10-39
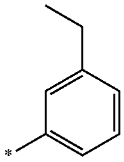
10-40
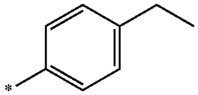
10-41
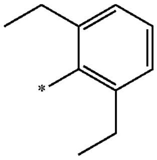
10-42
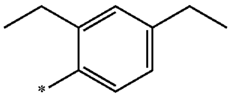
10-43
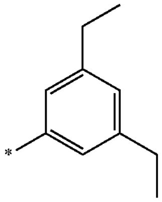
10-44
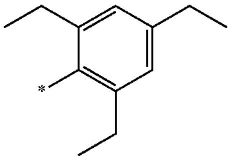
10-45
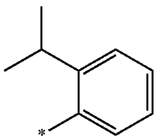
10-46
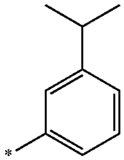

-continued
10-47
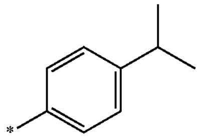
10-48
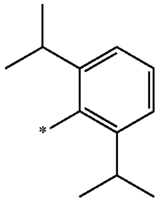
10-49
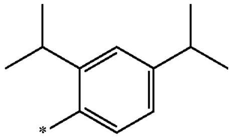
10-50
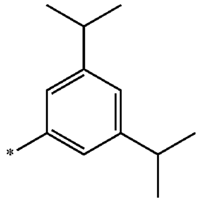
10-51
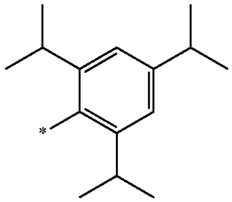
10-52
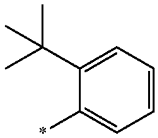
10-53
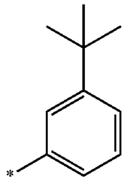
10-54
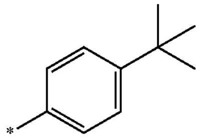
-continued
10-55
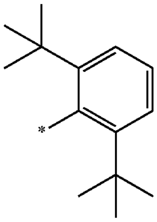
10-56
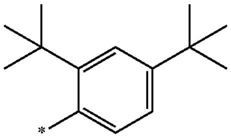
10-57
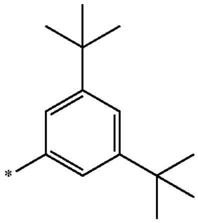
10-58
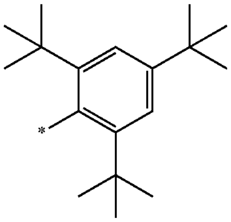
10-59
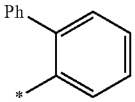
10-60
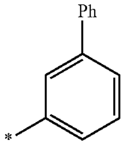
10-61
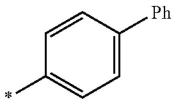
10-62
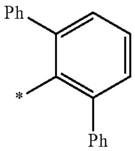
10-63
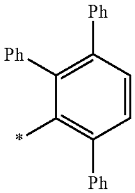

-continued
10-64
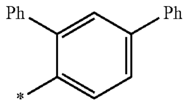
10-65
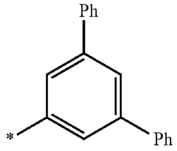
10-66
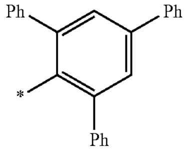
10-67
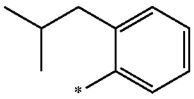
10-68
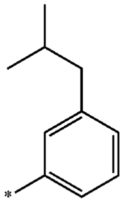
10-69
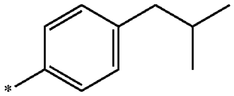
10-70
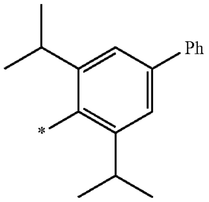
10-71
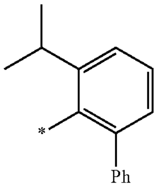
10-72
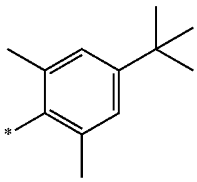
-continued
10-73
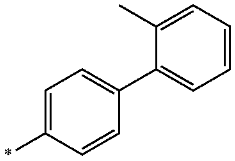
10-74
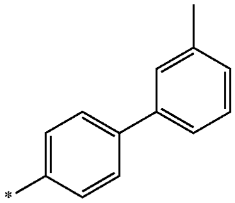
10-75
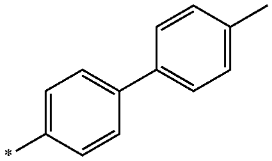
10-76
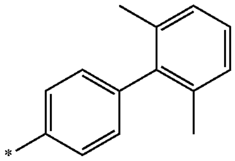
10-77
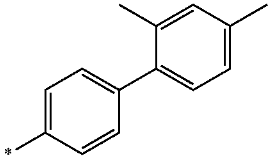
10-78
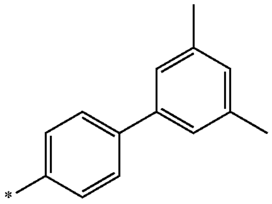
10-79
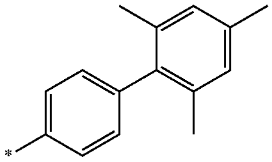
10-80
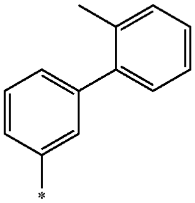

-continued
10-81
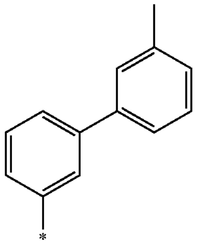
10-82
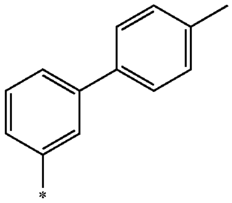
10-83
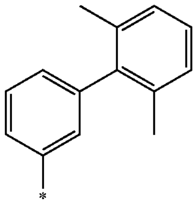
10-84
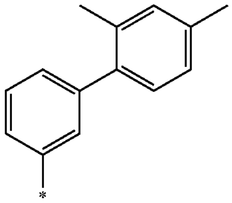
10-85
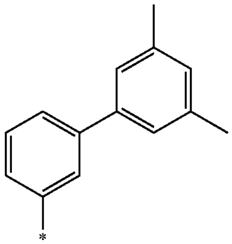
10-86
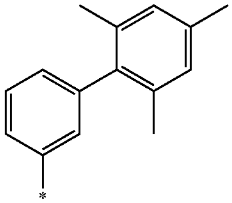
10-87
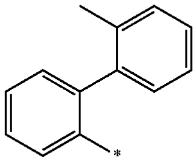
-continued
10-88
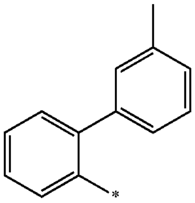
10-89
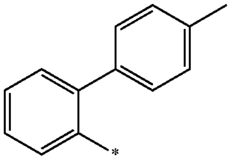
10-90
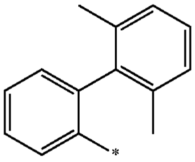
10-91
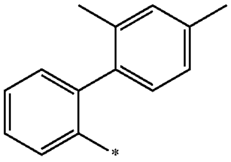
10-92
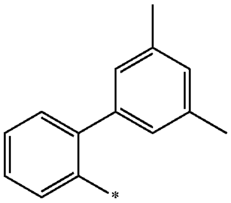
10-93
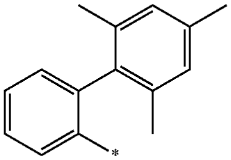
10-94
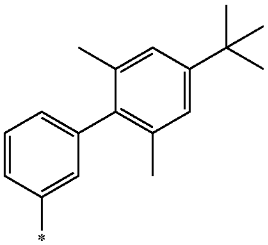
10-95
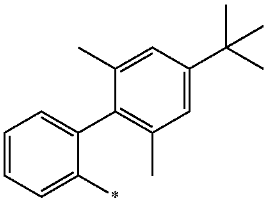

-continued
10-96
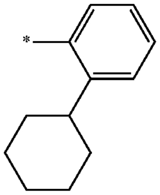
10-97
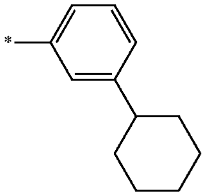
10-98
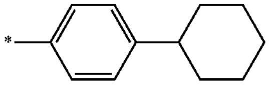
10-99
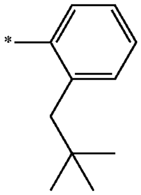
10-100
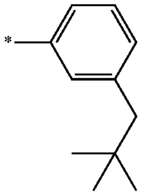
10-101
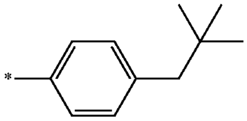
10-102
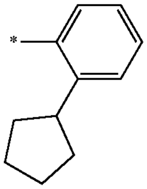
10-103
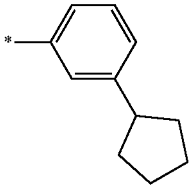
10-104
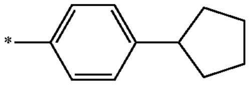
-continued
10-105
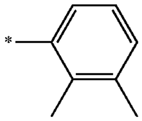
10-106
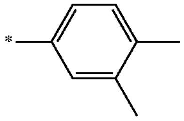
10-107
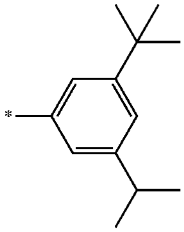
10-108
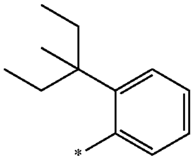
10-109
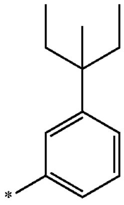
10-110
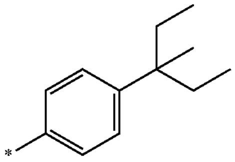
10-111
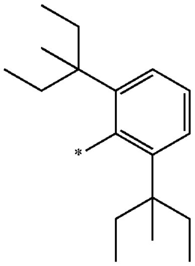
10-112
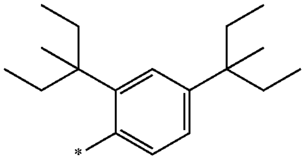

-continued
10-113
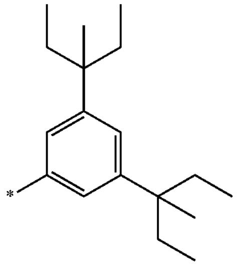
10-114
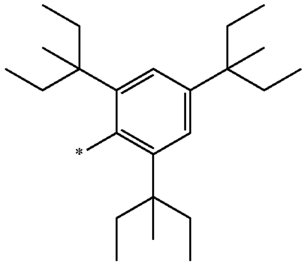
10-115
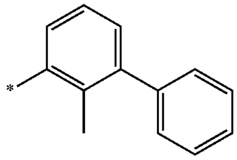
10-116
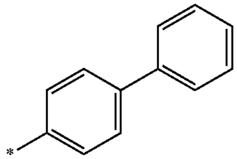
10-117
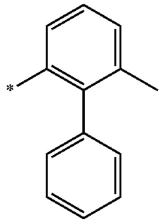
10-118
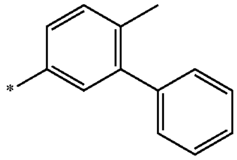
10-119
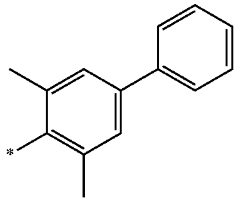
-continued
10-120
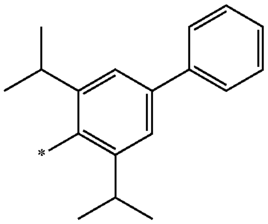
10-121
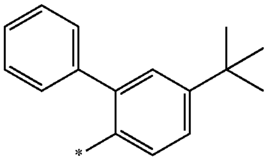
10-122
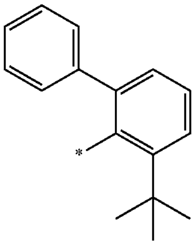
10-123
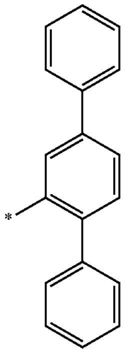
10-124
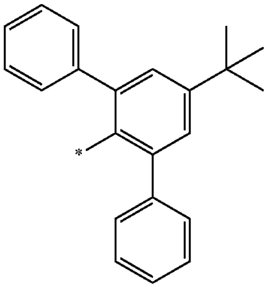
10-125
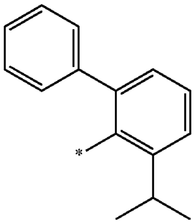

-continued
10-126
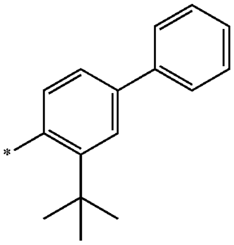
10-127
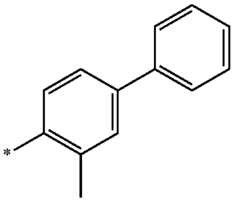
10-128
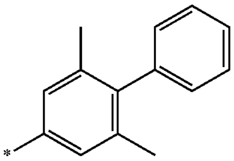
10-129
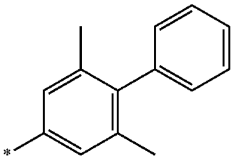
10-130
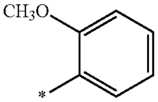
10-131
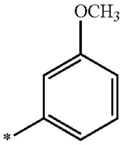
10-132
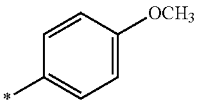
10-133
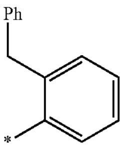
10-134
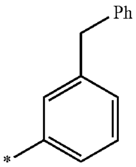
-continued
10-135
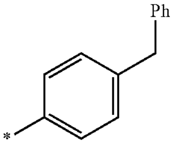
10-136
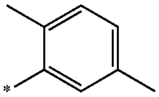
10-137
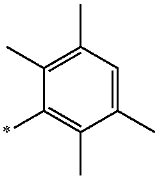
10-138
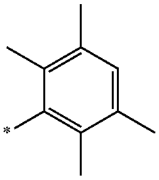
10-139
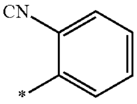
10-140
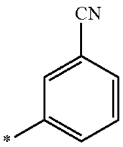
10-141
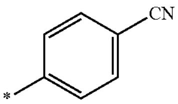
10-142
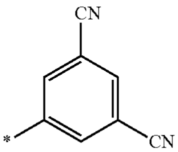
10-143
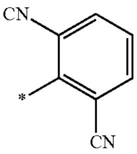
10-144
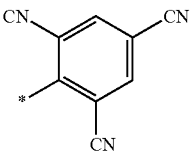

-continued
10-145
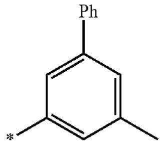
10-201
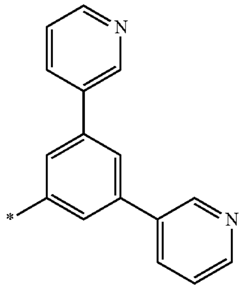
10-202
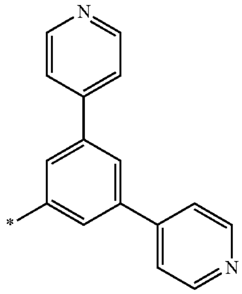
10-203
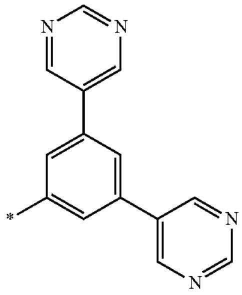
10-204
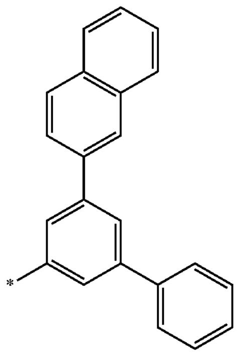
-continued
10-205
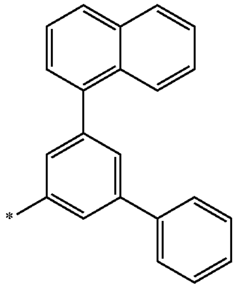
10-206
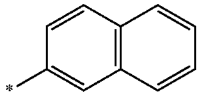
10-207
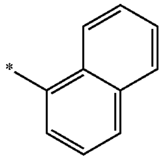
10-208
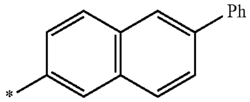
10-209
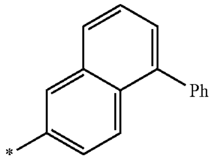
10-210
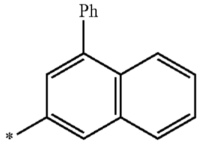
10-211
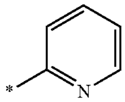
10-212
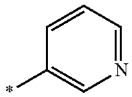
10-213
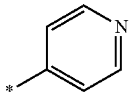
10-214
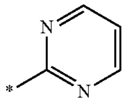
10-215
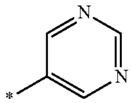

-continued
10-216
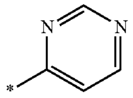
10-217
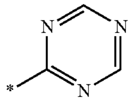
10-218
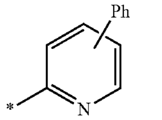
10-219
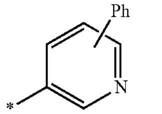
10-220
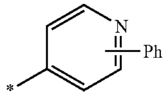
10-221
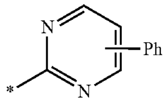
10-222
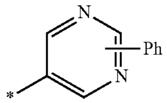
10-223
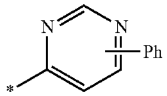
10-224
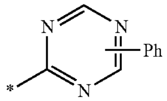
10-225
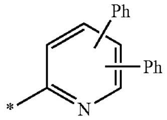
10-226
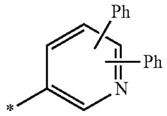
10-227
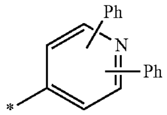
10-228
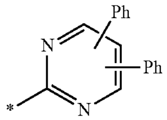
-continued
10-229
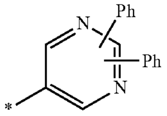
10-230
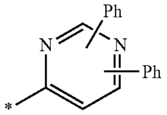
10-231
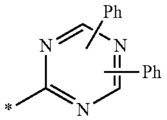
10-232
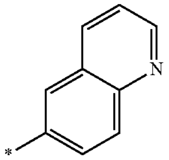
10-233
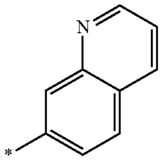
10-234
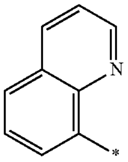
10-235
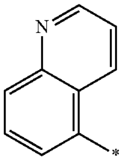
10-236
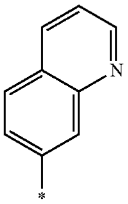
10-237
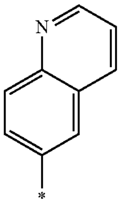

-continued
10-238
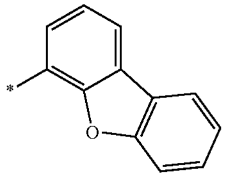
10-239
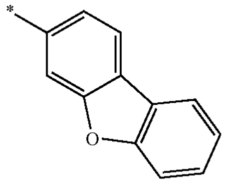
10-240
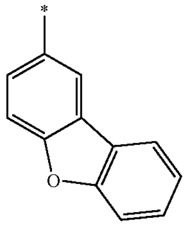
10-241
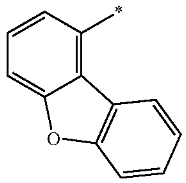
10-242
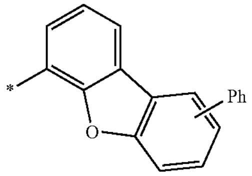
10-243
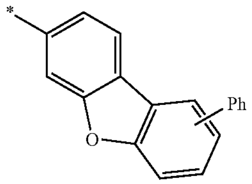
10-244
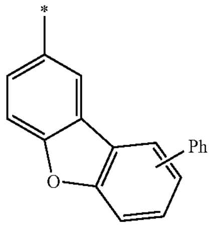
10-245
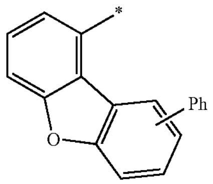
-continued
10-246
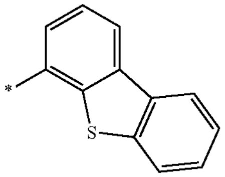
10-247
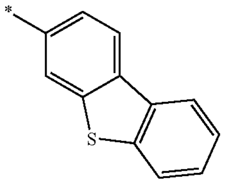
10-248
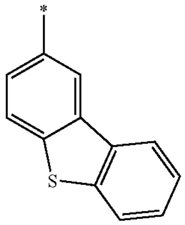
10-249
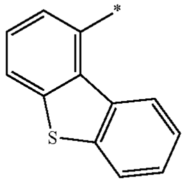
10-250
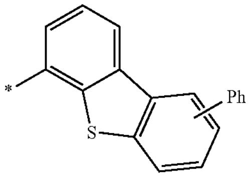
10-251
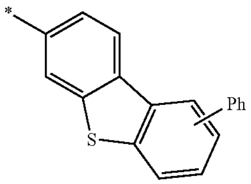
10-252
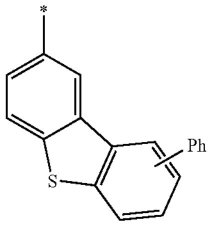
10-253
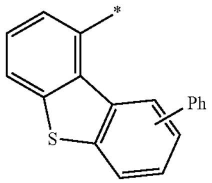

-continued
10-254
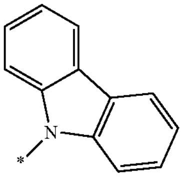
10-255
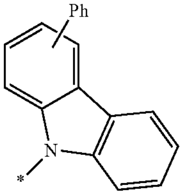
10-256
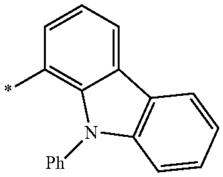
10-257
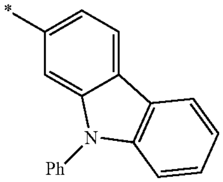
10-258
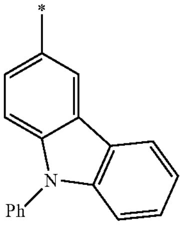
10-259
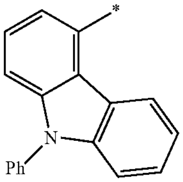
10-260
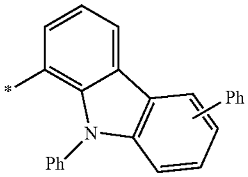
10-261
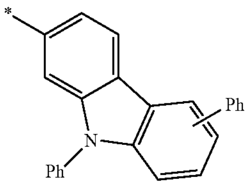
-continued
10-262
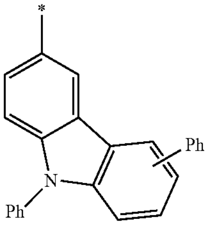
10-263
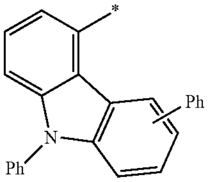
10-264
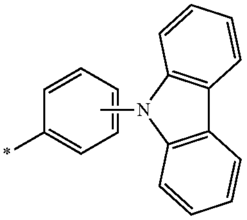
10-265
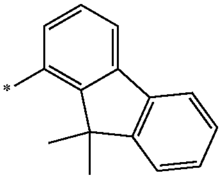
10-266
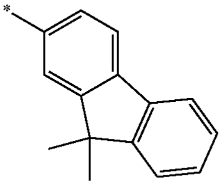
10-267
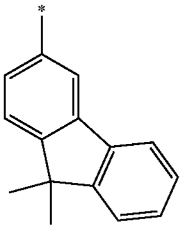
10-268
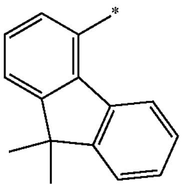

-continued
10-269
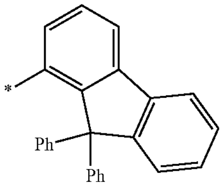
10-270
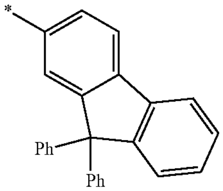
10-271
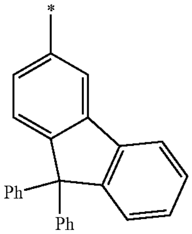
10-272
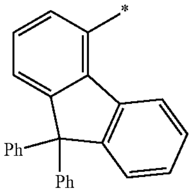
10-273
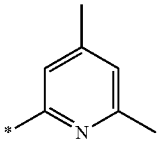
10-274
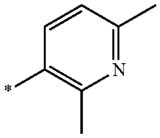
10-275
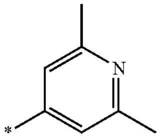
10-276
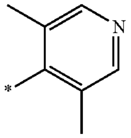
10-277
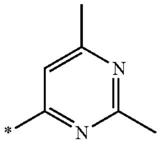
-continued
10-278
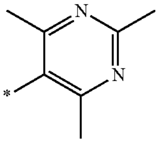
10-279
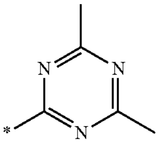
10-280
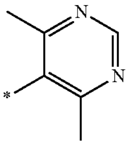
10-281
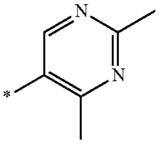
10-282
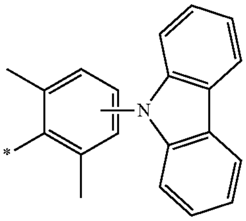
10-283
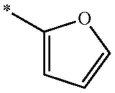
10-284
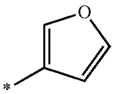
10-285
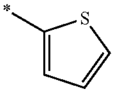
10-286
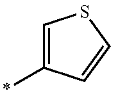
10-287
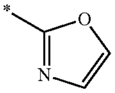
10-288
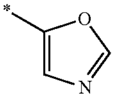
10-289
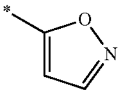

-continued
10-290
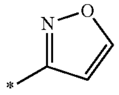
10-291
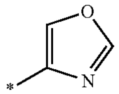
10-292
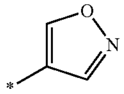
10-293
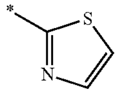
10-294
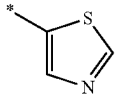
10-295
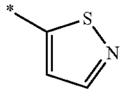
10-296
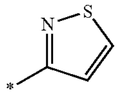
10-297
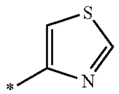
10-298
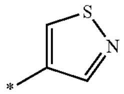
10-299
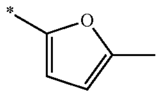
10-300
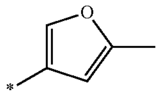
10-301
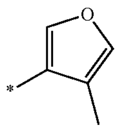
10-302
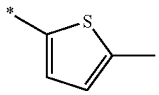
10-303
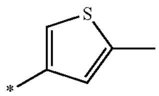
-continued
10-304
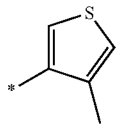
10-305
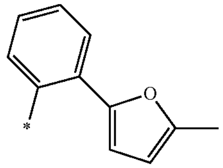
10-306
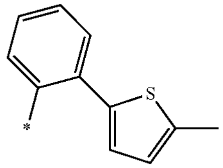
10-307
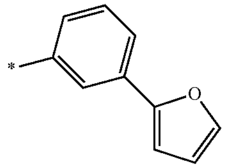
10-308
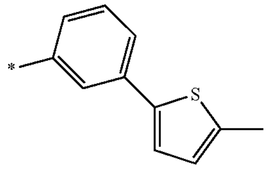
10-309
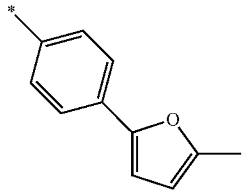
10-310
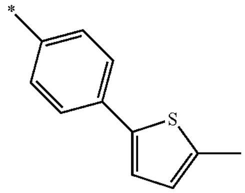
10-311
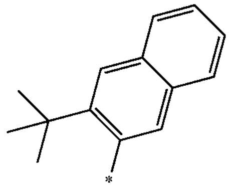

-continued
10-312
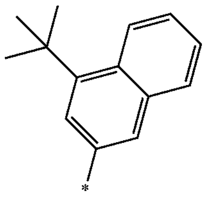
10-313
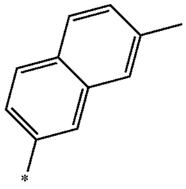
10-314
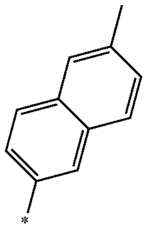
10-315
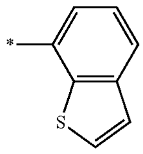
10-316
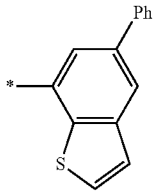
10-317
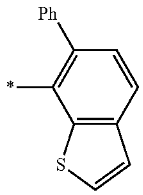
10-318
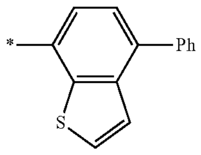
10-319
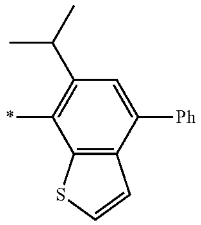
-continued
10-320
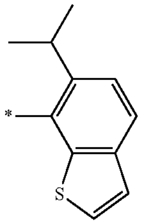
10-321
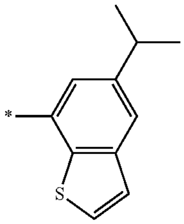
10-322
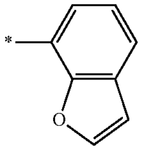
10-323
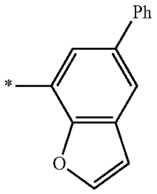
10-324
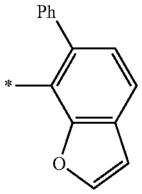
10-325
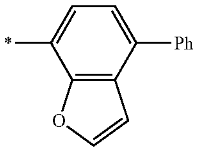
10-326
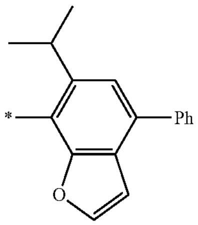

-continued
10-327
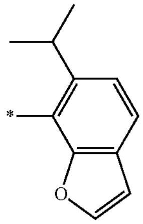
10-328
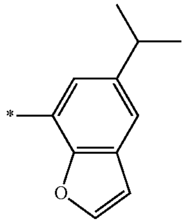
10-329
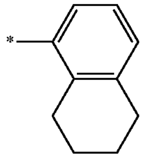
10-330
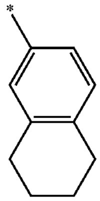
10-331
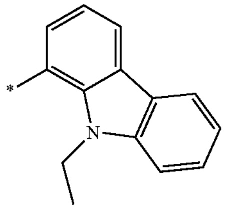
10-332
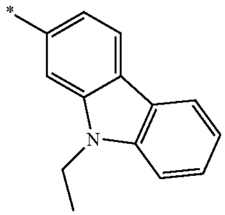
10-333
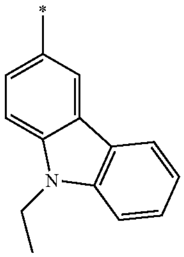
-continued
10-334
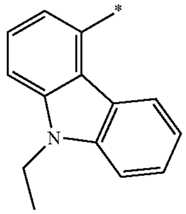
10-335
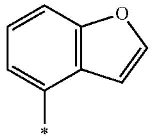
10-336
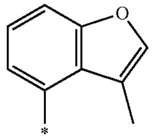
10-337
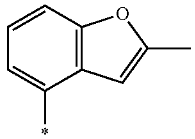
10-338
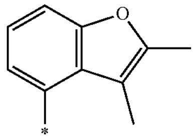
10-339
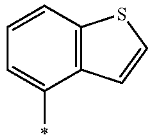
10-340
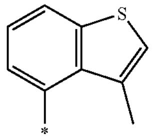
10-341
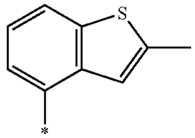
10-342
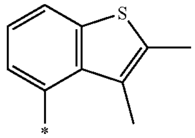

-continued 10-343

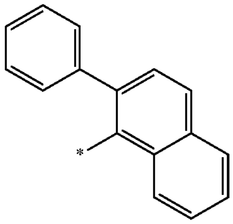

10-344

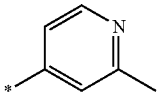

10-345

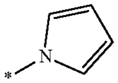

10-346

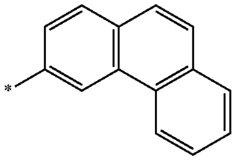

10-347

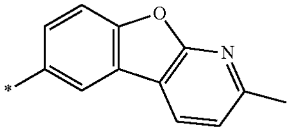

10-348

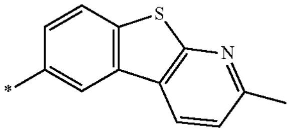

10-349

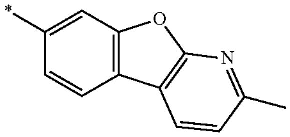

10-350

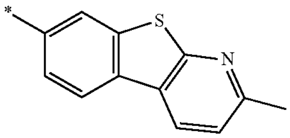

10-351

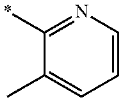

10-352

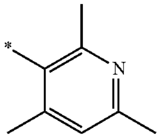

10-353

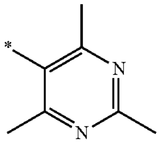

-continued 10-354

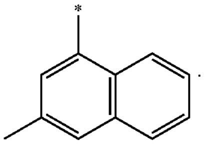

In Formulae 9-1 to 9-39, 9-201 to 9-230, 10-1 to 10-145 and 10-201 to 10-354, indicates a binding site to a neighboring atom, Ph is a phenyl group, TMS is a trimethylsilyl group, TMG is a trimethylgermyl group, and OMe is a methoxy group.

The "group represented by one of Formulae 9-1 to 9-39 in which at least one hydrogen is substituted with deuterium" and the "group represented by one of Formulae 9-201 to 9-230 in which at least one hydrogen is substituted with deuterium" may be, for example, a group represented by one of Formulae 9-501 to 9-514 and 9-601 to 9-637:

9-501

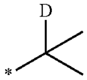

9-502

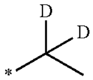

9-503

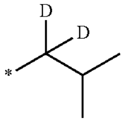

9-504

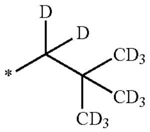

9-505

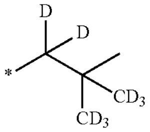

9-506

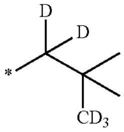

9-507

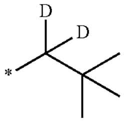

9-508

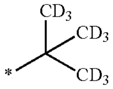

9-509

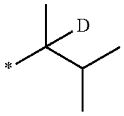

-continued
9-510
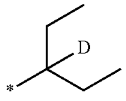
9-511
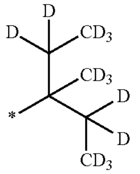
9-512
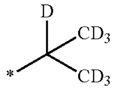
9-513
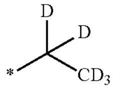
9-514
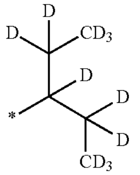
9-601
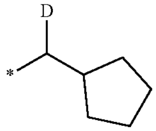
9-602
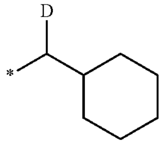
9-603
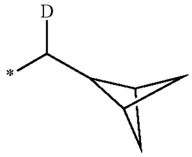
9-604
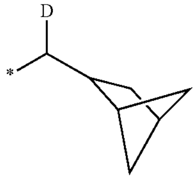
9-605
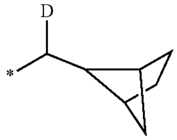
-continued
9-606
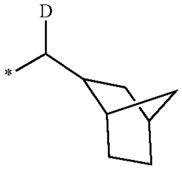
9-607
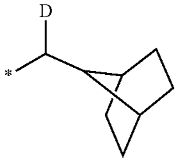
9-608
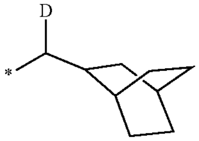
9-609
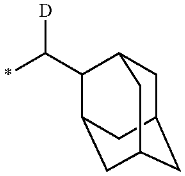
9-610
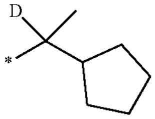
9-611
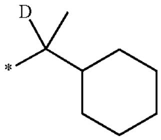
9-612
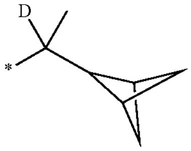
9-613
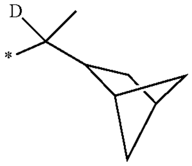
9-614
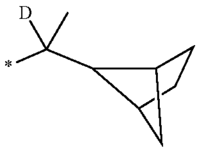

-continued
9-615
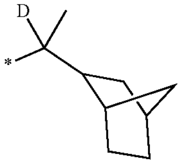
9-616
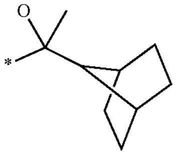
9-617
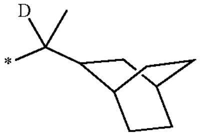
9-618
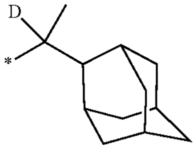
9-619
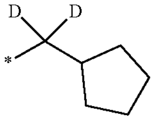
9-620
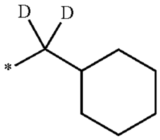
9-621
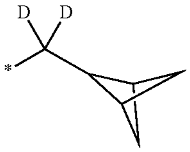
9-622
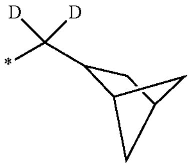
9-623
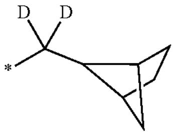
9-624
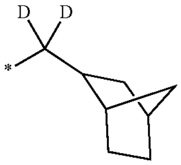
-continued
9-625
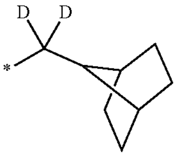
9-626
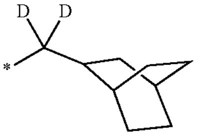
9-627
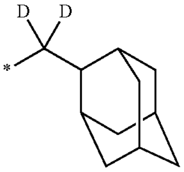
9-628
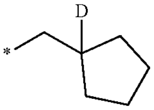
9-629
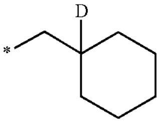
9-630
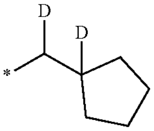
9-631
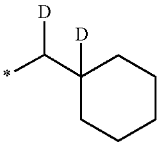
9-632
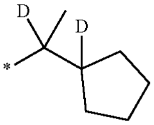
9-633
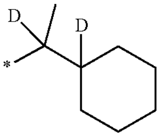
9-634
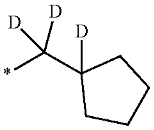

-continued 9-635

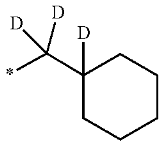

9-636

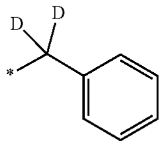

9-637

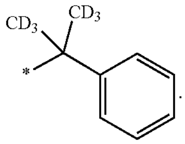

The "group represented by one of Formulae 9-1 to 9-39 in which at least one hydrogen is substituted with —F" and the "group represented by one of Formulae 9-201 to 9-230 in which at least one hydrogen is substituted with —F" may be, for example, a group represented by one of Formulae 9-701 to 9-710:

9-701

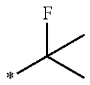

9-702

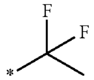

9-703

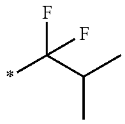

9-704

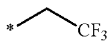

9-705

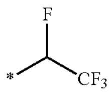

9-706

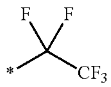

9-707

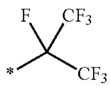

9-708

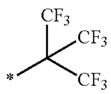

9-709

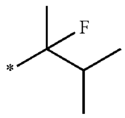

-continued 9-710

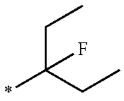

The "group represented by one of Formulae 10-1 to 10-145 in which at least one hydrogen is substituted with deuterium" and the "group represented by one of Formulae 10-201 to 10-354 in which at least one hydrogen is substituted with deuterium" may be, for example, a group represented by one of Formulae 10-501 to 10-553:

10-501

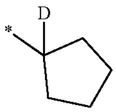

10-502

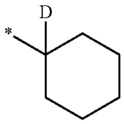

10-503

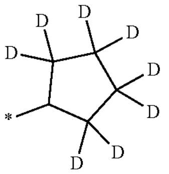

10-504

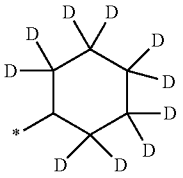

10-505

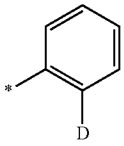

10-506

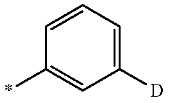

10-507

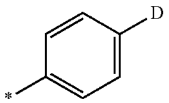

10-508

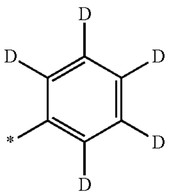

-continued
10-509
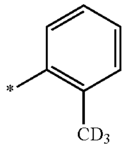
10-510
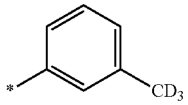
10-511
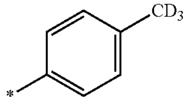
10-512
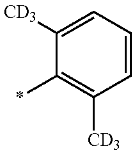
10-513
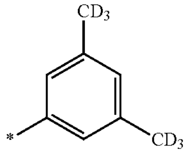
10-514
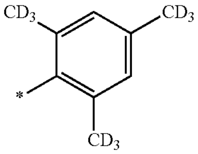
10-515
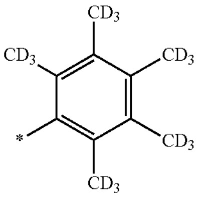
10-516
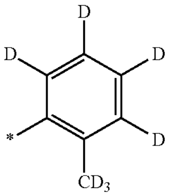
10-517
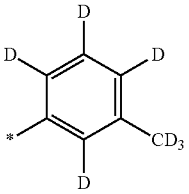
-continued
10-518
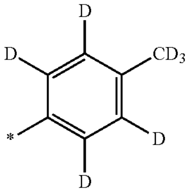
10-519
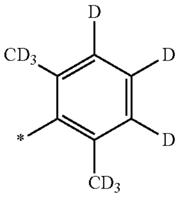
10-520
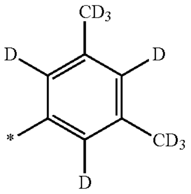
10-521
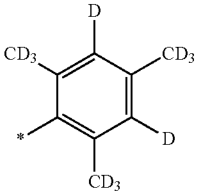
10-522
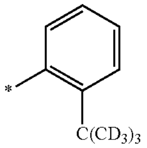
10-523
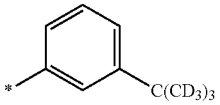
10-524
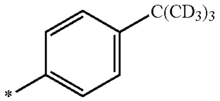
10-525
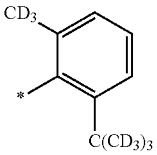
10-526
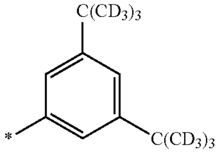

-continued
10-527
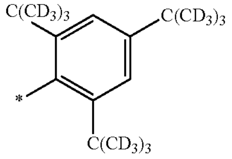
10-528
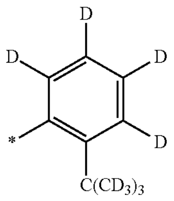
10-529
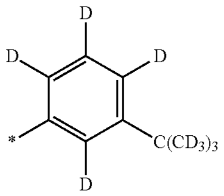
10-530
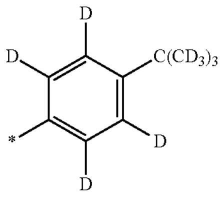
10-531
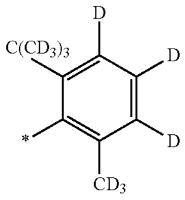
10-532
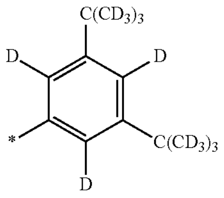
10-533
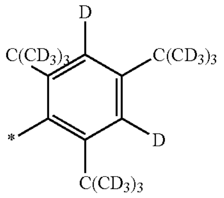
10-534
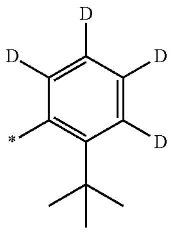
-continued
10-535
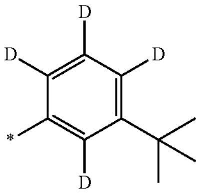
10-536
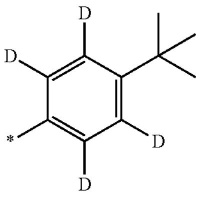
10-537
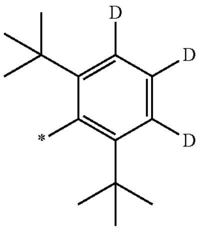
10-538
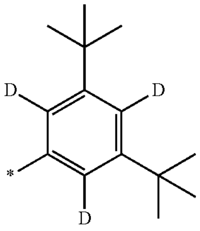
10-540
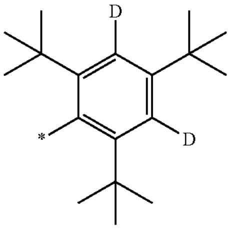
10-541
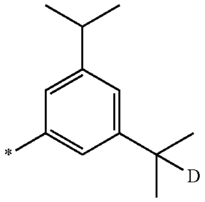
10-542
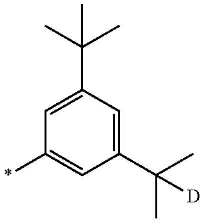

-continued
10-543
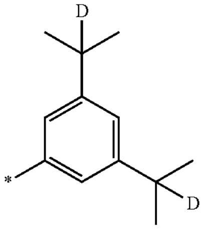
10-544
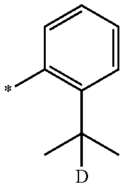
10-545
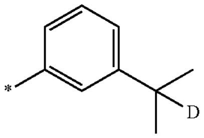
10-546
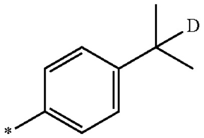
10-547
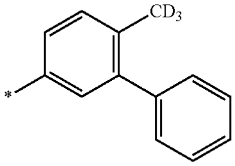
10-548
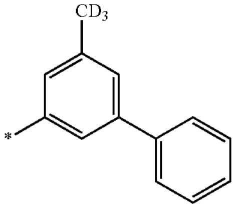
10-549
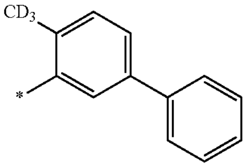
10-550
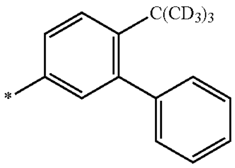
-continued
10-551
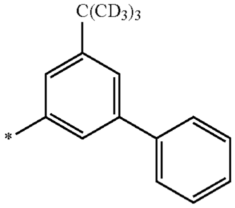
10-552
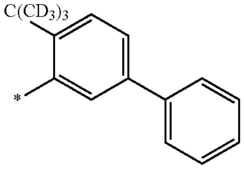
10-553
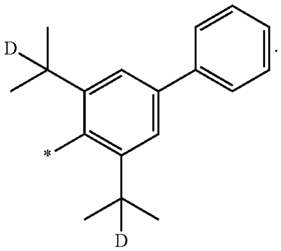
The "group represented by one of Formulae 10-1 to 10-145 in which at least one hydrogen is substituted with —F" and the "group represented by one of Formulae 10-201 to 10-354 in which at least one hydrogen is substituted with —F" may be, for example, a group represented by one of Formulae 10-601 to 10-636:
10-601
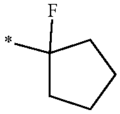
10-602
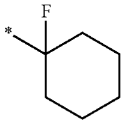
10-603
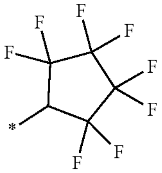
10-604
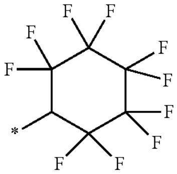
10-605
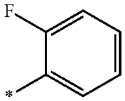

-continued
10-606
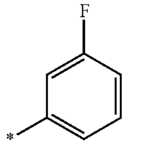
10-607
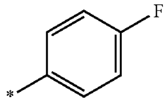
10-608
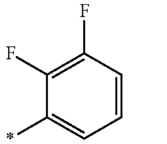
10-609
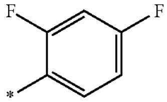
10-610
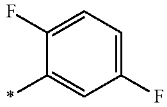
10-611
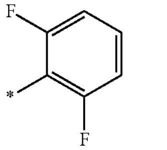
10-612
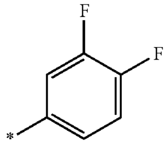
10-613
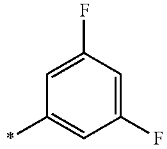
10-614
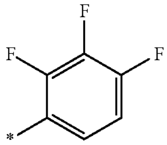
10-615
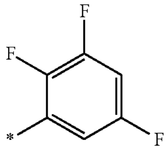
-continued
10-616
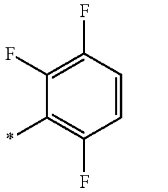
10-617
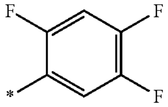
10-618
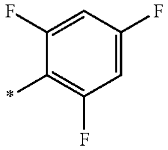
10-619
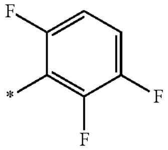
10-620
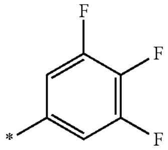
10-621
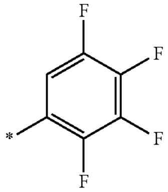
10-622
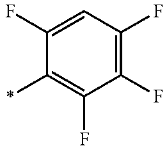
10-623
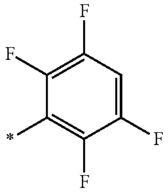
10-624
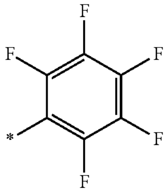

-continued 10-625

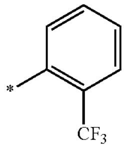

10-626

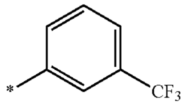

10-627

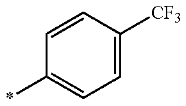

10-628

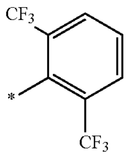

10-629

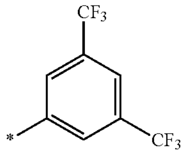

10-630

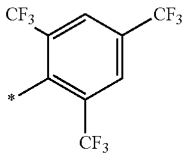

10-631

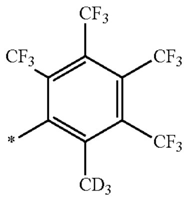

10-632

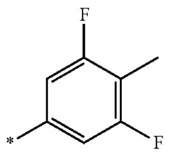

10-633

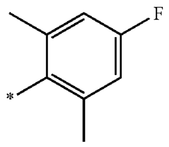

10-634

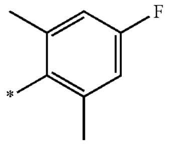

-continued 10-635

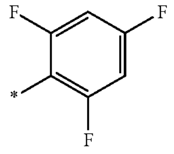

10-636

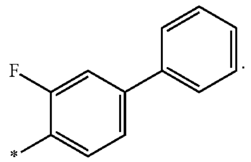

In Formulae 2A and 2B, i) two or more of a plurality of $R_1$(s) may be optionally linked to each other to form a $C_5$-$C_{30}$ carbocyclic group that is unsubstituted or substituted with at least one $R_{10a}$ or a $C_1$-$C_{60}$ heterocyclic group that is unsubstituted or substituted with at least one $R_{10a}$, ii) two or more of a plurality of $R_2$(s) may be optionally linked to each other to form a $C_5$-$C_{30}$ carbocyclic group that is unsubstituted or substituted with at least one $R_{10a}$ or a $C_1$-$C_{60}$ heterocyclic group that is unsubstituted or substituted with at least one $R_{10a}$, iii) two or more of a plurality of Ra(s) may be optionally linked to each other to form a $C_5$-$C_{30}$ carbocyclic group that is unsubstituted or substituted with at least one $R_{10a}$ or a $C_1$-$C_{60}$ heterocyclic group that is unsubstituted or substituted with at least one $R_{10a}$, iv) two or more of a plurality of $R_4$(s) may be optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$. $R_{10a}$ may be the same as described in connection with $R_1$.

* and *' in Formulae 2A and 2B each indicate a binding site to M in Formula 1.

In one or more embodiments, a group represented by in

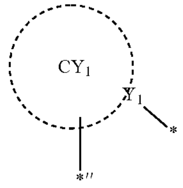

in Formula 2A may be a group represented by one of Formulae CY1(1) to CY1(42):

CY1(1)

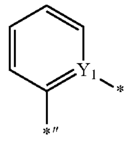

CY1(2)

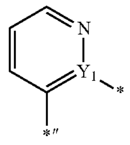

-continued
CY1(3)
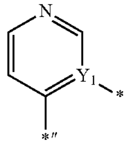
CY1(4)
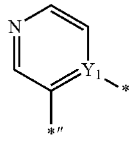
CY1(5)
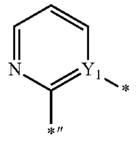
CY1(6)
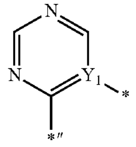
CY1(7)
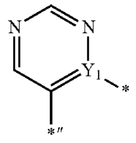
CY1(8)
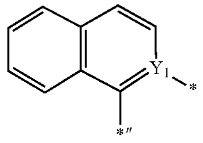
CY1(9)
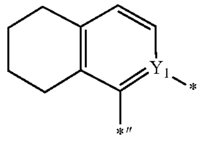
CY1(10)
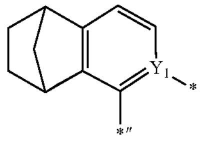
CY1(11)
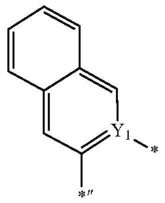
-continued
CY1(12)
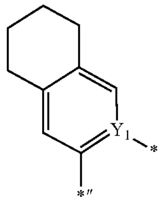
CY1(13)
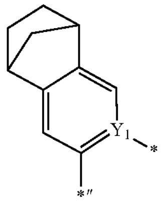
CY1(14)
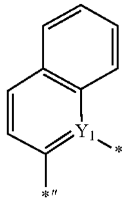
CY1(15)
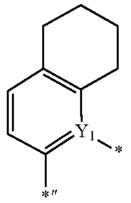
CY1(16)
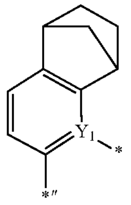
CY1(17)
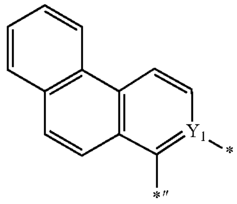
CY1(18)
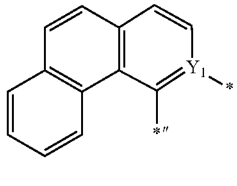

-continued
CY1(19)
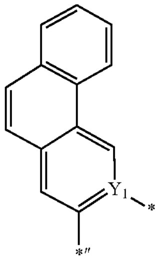
CY1(20)
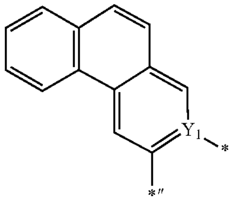
CY1(21)
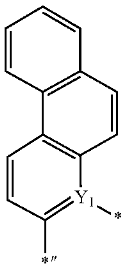
CY1(22)
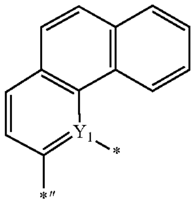
CY1(23)
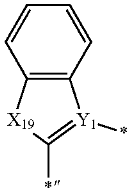
CY1(24)
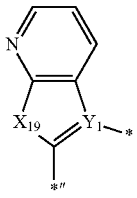
CY1(25)
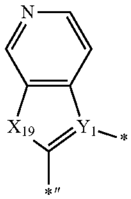
-continued
CY1(26)
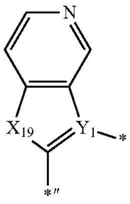
CY1(27)
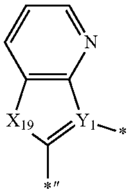
CY1(28)
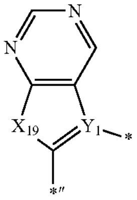
CY1(29)
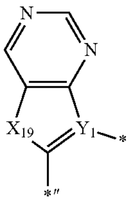
CY1(30)
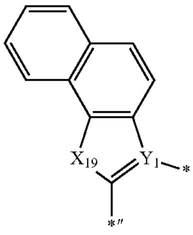
CY1(31)
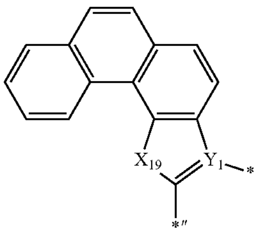
CY1(32)
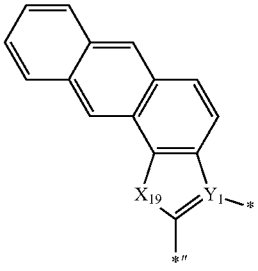

-continued
CY1(33)
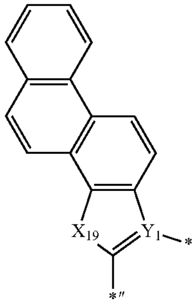
CY1(34)
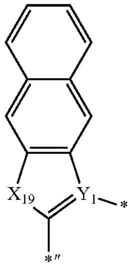
CY1(35)
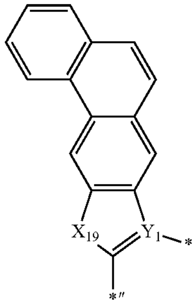
CY1(36)
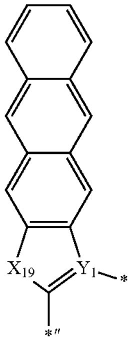
CY1(37)
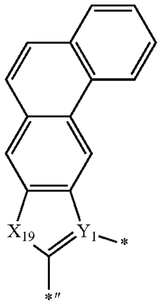
-continued
CY1(38)
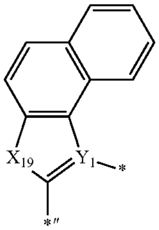
CY1(39)
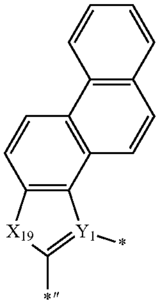
CY1(40)
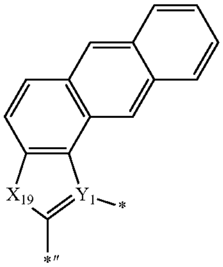
CY1(41)
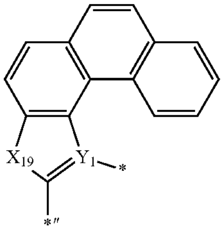
CY1(42)
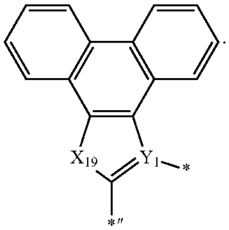
In Formulae CY1(1) to CY1(42),
$X_{19}$ is O, S, $N(R_{19a})$, $C(R_{19a})(R_{19b})$, or $Si(R_{19a})(R_{19b})$, and $R_{19a}$ and $R_{19b}$ are the same as described in connection with $R_1$, $Y_1$ may be carbon or nitrogen, and
* indicates a binding site to M in Formula 1, and *" indicates a binding site to a neighboring carbon atom in Formula 2A.

In one or more embodiments, a group represented by

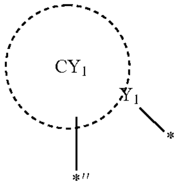

in Formula 2A may be a group represented by one of Formulae CY1(1) to CY1(22).

In one or more embodiments, a group represented by

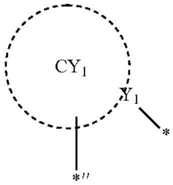

in Formula 2A may be a group represented by one of Formulae CY1(23) to CY1(42).

In one or more embodiments, a group represented by

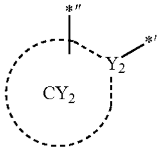

in Formula 2A may be a group represented by one of Formulae CY2(1) to CY2(40):

CY2(1)

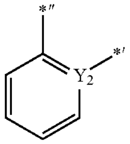

CY2(2)

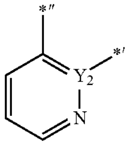

CY2(3)

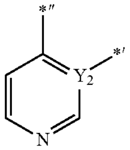

CY2(4)

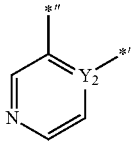

-continued

CY2(5)

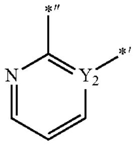

CY2(6)

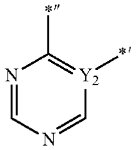

CY2(7)

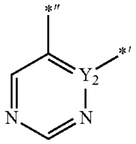

CY2(8)

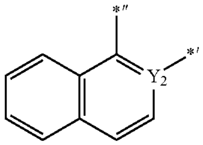

CY2(9)

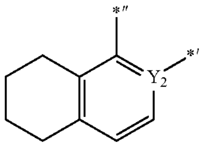

CY2(10)

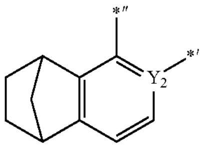

CY2(11)

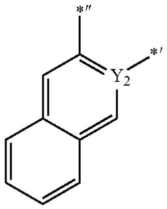

CY2(12)

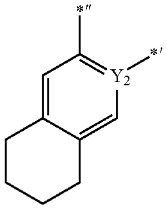

CY2(13)

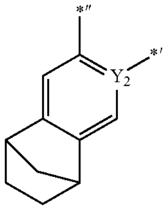

-continued
CY2(14)
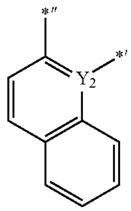
CY2(15)
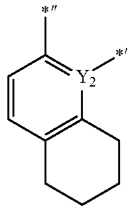
CY2(16)
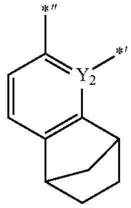
CY2(17)
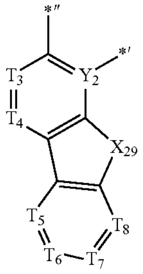
CY2(18)
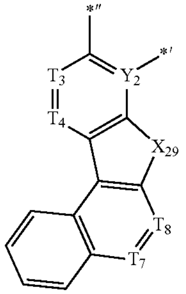
CY2(19)
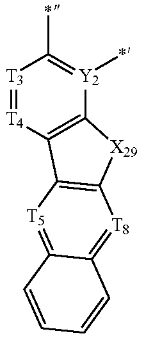
-continued
CY2(20)
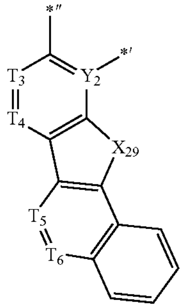
CY2(21)
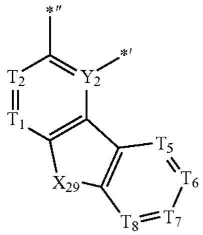
CY2(22)
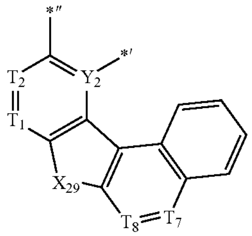
CY2(23)
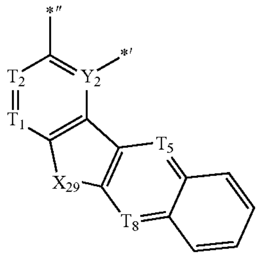
CY2(24)
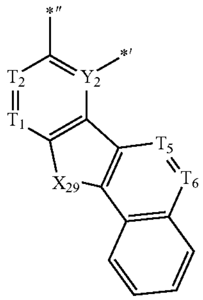
CY2(25)
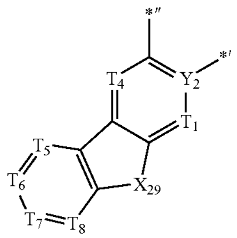

-continued
CY2(26)
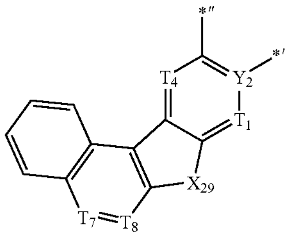
CY2(27)
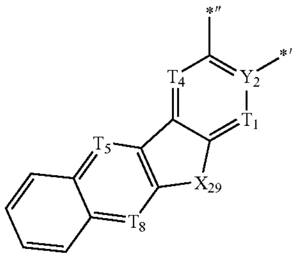
CY2(28)
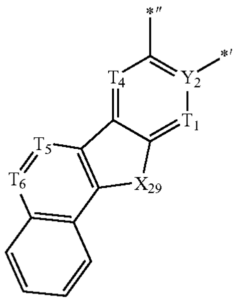
CY2(29)
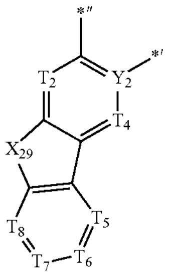
CY2(30)
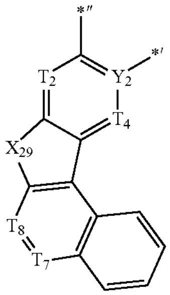
-continued
CY2(31)
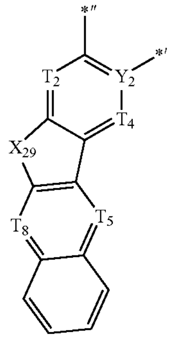
CY2(32)
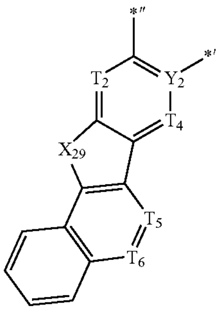
CY2(33)
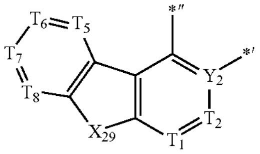
CY2(34)
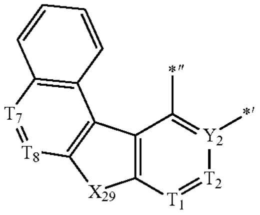
CY2(35)
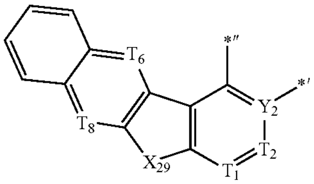
CY2(36)
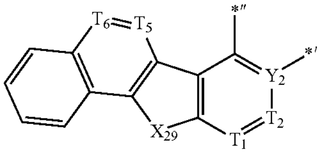
CY2(37)
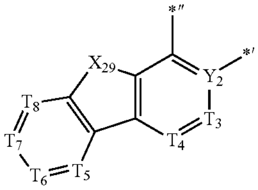

-continued

CY2(38)

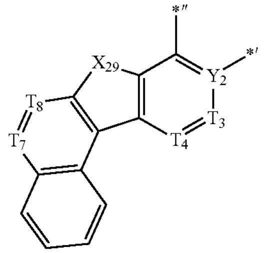

CY2(39)

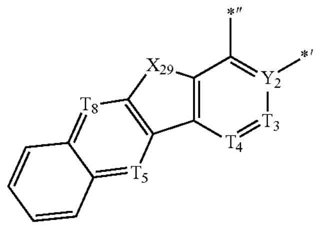

CY2(40)

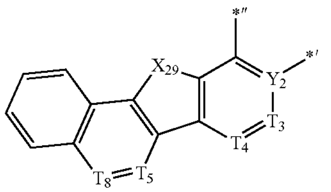

In Formulae CY2(1) to CY2(40), $T_1$ to $T_8$ may each be carbon or nitrogen, $Y_2$ may be carbon or nitrogen, $X_{29}$ is O, S, $N(R_{29a})$, $C(R_{29a})(R_{29b})$, or $Si(R_{29a})(R_{29b})$, and $R_{29a}$ and $R_{29b}$ are the same as described in connection with $R_2$.

*' indicates a binding site to M in Formula 1, and *" indicates a binding site to ring CY1 in Formula 2A.

For example, $T_1$ to $T_8$ in Formulae CY2(17) to CY2(40) may each be carbon.

In one or more embodiments, at least one of $T_3$ to $T_8$ in Formula CY2(17) may be nitrogen, at least one of $T_3$, $T_4$, $T_7$ and $T_8$ in Formula CY2(18) may be nitrogen, at least one of $T_3$, $T_4$, $T_5$ and $T_8$ in Formula CY2(19) may be nitrogen, at least one of $T_3$, $T_4$, $T_5$ and $T_8$ in Formula CY2(20) may be nitrogen, at least one of $T_1$, $T_2$, $T_5$, $T_6$, $T_7$ and $T_8$ in Formula CY2(21) may be nitrogen, at least one of $T_1$, $T_2$, $T_5$ and $T_8$ in Formula CY2(22) may be nitrogen, at least one of $T_1$, $T_2$, $T_5$ and $T_8$ in Formula CY2(23) may be nitrogen, at least one of $T_1$, $T_2$, $T_5$ and $T_8$ of Formula CY2(24) may be nitrogen, at least one of $T_1$, $T_4$, $T_5$, $T_6$, $T_7$ and $T_8$ in Formula CY2(25) may be nitrogen, at least one of $T_1$, $T_4$, $T_7$ and $T_8$ in Formula CY2(26) may be nitrogen, at least one of $T_1$, $T_4$, $T_5$ and $T_8$ in Formula CY2(27) may be nitrogen, at least one of $T_1$, $T_4$, $T_5$ and $T_6$ in Formula CY2(28) may be nitrogen, at least one of $T_2$, $T_4$, $T_5$, $T_6$, $T_7$ and $T_8$ in Formula CY2(29) may be nitrogen, at least one of $T_2$, $T_4$, $T_7$ and $T_8$ in Formula CY2(30) may be nitrogen, at least one of $T_2$, $T_4$, $T_5$ and $T_8$ in Formula CY2(31) may be nitrogen, at least one of $T_2$, $T_4$, $T_5$ and $T_6$ of Formula CY2(32) may be nitrogen, at least one of $T_1$, $T_2$, $T_5$, $T_6$, $T_7$ and $T_8$ in Formula CY2(33) may be nitrogen, at least one of $T_1$, $T_2$, $T_7$ and $T_8$ in Formula CY2(34) may be nitrogen, at least one of $T_1$, $T_2$, $T_5$ and $T_8$ in Formula CY2(35) may be nitrogen, at least one of $T_1$, $T_2$, $T_5$ and $T_6$ of Formula CY2(36) may be nitrogen, at least one of $T_3$ to $T_8$ of Formula CY2(37) may be nitrogen, at least one of $T_3$, $T_4$, $T_7$ and $T_8$ of Formula CY2(38) may be nitrogen, at least one of $T_3$, $T_4$, $T_5$ and $T_8$ in Formula CY2(39) may be nitrogen, or at least one of $T_3$ to $T_8$ of Formula CY2(40) may be nitrogen.

In one or more embodiments, in Formulae CY2(17) to CY2(40), $T_8$ may be N and $T_1$ to $T_7$ may each be carbon.

In one or more embodiments, a group represented by

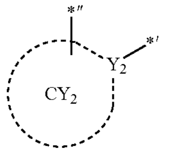

in Formula 2A may be a group represented by one of Formulae CY2(17) to CY2(40).

In one or more embodiments, a group represented by

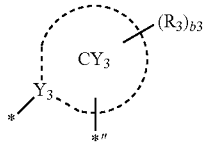

n Formula 2B may be a group represented by Formula CY3(1):

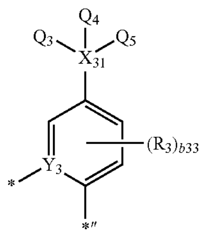

In Formula CY3(1), $Y_3$ may be carbon or nitrogen, $X_{31}$ may be Si or Ge, and $R_3$ and $Q_3$ to $Q_5$ are the same as described in the present specification, b33 may each independently be an integer from 0 to 3, two or more of $R_3$(s) in the number of b33 may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$ (for example, a cyclohexane group, a norbornane group, a benzene group, a pyridine group, a naphthalene group, a quinoline group, or an isoquinoline group, each unsubstituted or substituted with at least one $R_{10a}$),

* indicates a binding site to M in Formula 1, and

*" indicates a binding site to ring $CY_4$ in Formula 2B.

For example, at least one of Ra(s) in the number of b33 in Formula CY3(1) may include two or more of carbon.

In one or more embodiments, a group represented by

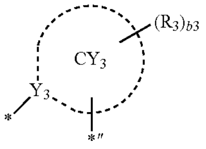

in Formula 2B may be a group represented by one of Formulae CY3-1 to CY3-16:

CY3-1

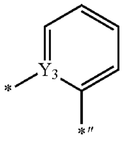

CY3-2

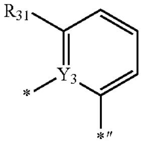

CY3-3

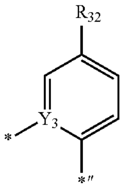

CY3-4

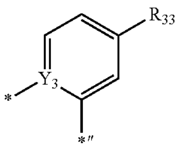

CY3-5

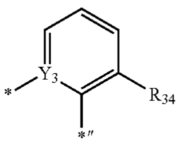

-continued

CY3-6

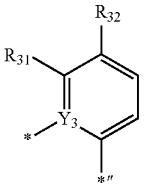

CY3-7

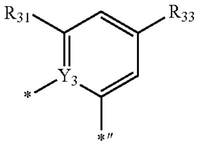

CY3-8

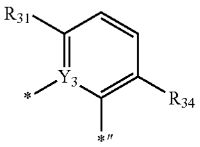

CY3-9

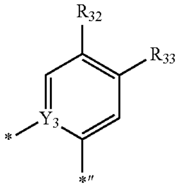

CY3-10

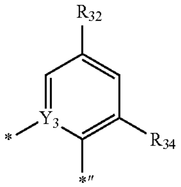

CY3-11

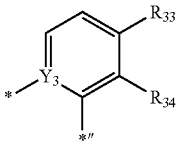

CY3-12

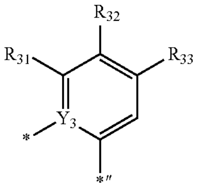

CY3-13

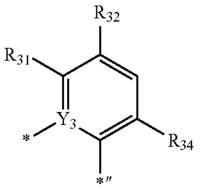

CY3-14

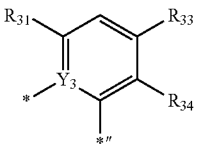

-continued

CY3-15

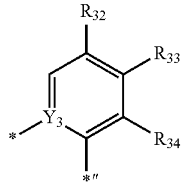

CY3-16

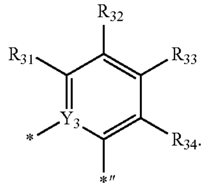

In Formulae CY3-1 to CY3-16, $R_{31}$ to $R_{34}$ are the same as described in connection with $R_3$, and each of $R_{31}$ to $R_{34}$ is not hydrogen, $Y_3$ may be carbon or nitrogen

* indicates a binding site to M in Formula 1, and

*" indicates a binding site to ring $CY_4$ in Formula 2B.

For example, $R_{32}$ in Formulae CY3-1 to CY3-16 may be a $C_1$-$C_{10}$ alkyl group substituted with at least one deuterium; —Si($Q_3$)($Q_4$)($Q_5$); or —Ge($Q_3$)($Q_4$)($Q_5$).

In one or more embodiments, $R_{33}$ in Formulae CY3-1 to CY3-16 may include two or more of carbons.

In one or more embodiments, $R_{33}$ and $R_{34}$ in Formulae CY3-1 to CY3-16 may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$ (for example, a cyclohexane group, a norbornane group, a benzene group, a pyridine group, a naphthalene group, a quinoline group, or an isoquinoline group, each unsubstituted or substituted with at least one $R_{10a}$).

In one or more embodiments, a group represented by

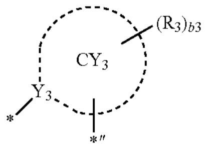

in Formula 2B may be a group represented by Formula CY3-3, CY3-6, CY3-9, CY3-10, CY3-12, CY3-13, CY3-15, or CY3-16, and $R_{32}$ in Formulae CY3-3, CY3-6, CY3-9, CY3-10, CY3-12, CY3-13, CY3-15 and CY3-16 may be —Si($Q_3$)($Q_4$)($Q_5$); or —Ge($Q_3$)($Q_4$)($Q_5$).

In one or more embodiments, a group represented by

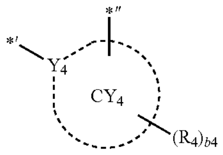

in Formula 2B may be a group represented by one of Formulae CY4-1 to CY4-16:

CY4-1

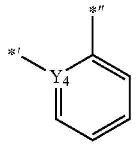

CY4-2

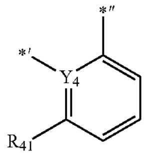

CY4-3

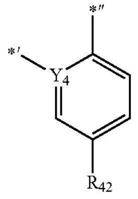

CY4-4

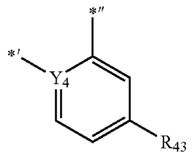

CY4-5

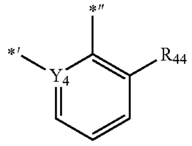

CY4-6

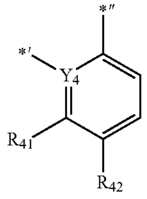

CY4-7

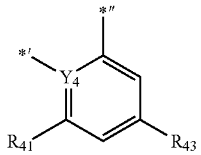

CY4-8

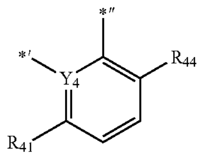

CY4-9

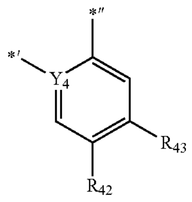

-continued

CY4-10

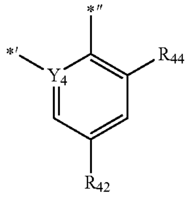

CY4-11

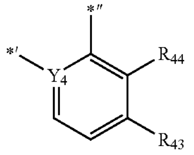

CY4-12

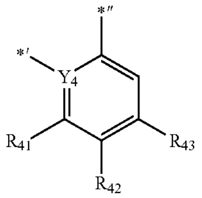

CY4-13

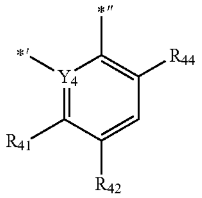

CY4-14

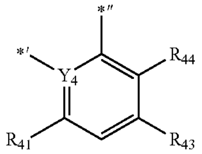

CY4-15

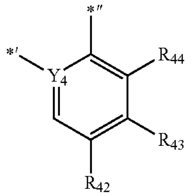

CY4-16

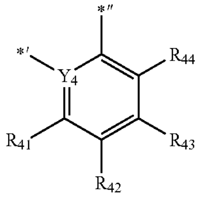

In Formulae CY4-1 to CY4-16, $Y_4$ may be carbon or nitrogen, $R_{41}$ to $R_{44}$ are the same as described in connection with $R_4$, and each of $R_{41}$ to $R_{44}$ is not hydrogen,

*' indicates a binding site to M in Formula 1, and

*" indicates a binding site to ring $CY_3$ in Formula 2B.

In one or more embodiments, the organometallic compound represented by Formula 1 may emit green light with a maximum emission wavelength in the range of about 500 nm to about 580 nm (in photoluminescence (PL) spectrum).

In one or more embodiments, the organometallic compound represented by Formula 1 may satisfy Condition 1 or Condition 2:

Condition 1

A group represented by

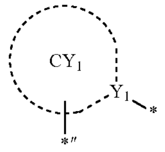

in Formula 2A is a group represented by one of Formulae CY1(1) to CY1(22), and a group represented by

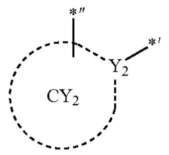

in Formula 2A is a group represented by one of Formulae CY2(17) to CY2(40), and a group represented by

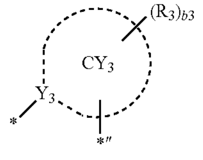

in Formula 2B is a group represented by Formula CY3(1) (for example, a group represented by Formula CY3-3, CY3-6, CY3-9, CY3-10, CY3-12, CY3-13, CY3-15, or CY3-16 in which $R_{32}$ is —$Si(Q_3)(Q_4)(Q_5)$ or —$Ge(Q_3)(Q_4)(Q_5)$), and a group represented by

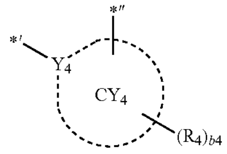

in Formula 2B is a group represented by one of Formulae CY4-1 to CY4-16.

Condition 2

A group represented by

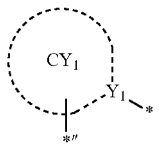

in Formula 2A is a group represented by one of Formulae CY1(23) to CY1(42), a group represented by

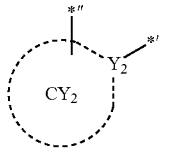

in Formula 2A is a group represented by one of Formulae CY2(17) to CY2(40), a group represented by

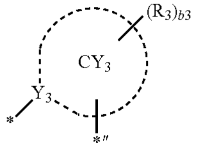

in Formula 2B is a group represented by Formula CY3(1) (for example, a group represented by Formula CY3-3, CY3-6, CY3-9, CY3-10, CY3-12, CY3-13, CY3-15, or CY3-16 in which $R_{32}$ is —$Si(Q_3)(Q_4)(Q_5)$ or —$Ge(Q_3)(Q_4)(Q_5)$), and a group represented by

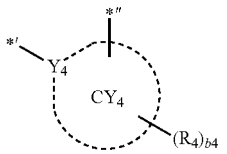

in Formula 2B is a group represented by one of Formulae CY4-1 to CY4-16.

Description of Formulae 5, 7, and 9

Formula 5

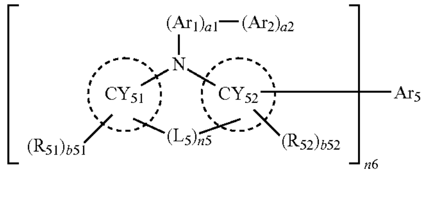

-continued

Formula 7

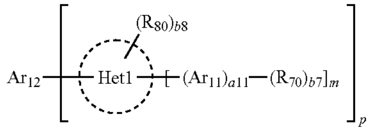

Formula 9

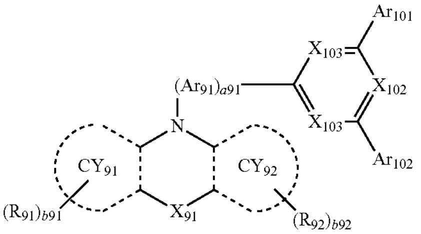

$Ar_1$, $Ar_2$, $Ar_{11}$, $Ar_{101}$ and $Ar_{102}$ in Formulae 5, 7, and 9 may each independently be a $C_5$-$C_{60}$ carbocyclic group unsubstituted or substituted with at least one $R_{50}$ or a $C_1$-$C_{60}$ heterocyclic group unsubstituted or substituted with at least one $R_{50}$, $Ar_{91}$ in Formula 9 may be a single bond, a $C_5$-$C_{60}$ carbocyclic group unsubstituted or substituted with at least one $R_{90}$, or a $C_1$-$C_{60}$ heterocyclic group unsubstituted or substituted with at least one $R_{90}$, $Ar_5$ and $Ar_{12}$ in Formulae 5 and 7 may each independently be a single bond, a $C_5$-$C_{60}$ carbocyclic group unsubstituted or substituted with at least one $R_{50a}$, or a $C_1$-$C_{60}$ heterocyclic group unsubstituted or substituted with at least one $R_{50a}$, or may not exist, n6 in Formula 5 may be 1, 2, or 3, and when n6 is 1, $Ar_s$ may not exist, p in Formula 7 may be 1, 2, or 3, and when p is 1, $Ar_{12}$ may not exist, a1 and a2 in Formula 5 may each independently be an integer from 0 to 5, and the sum of a1 and a2 may be 1 or more, ring $CY_{51}$, ring $CY_{52}$, ring CY91 and ring $CY_{92}$ in Formulae 5 and 9 may each independently be a $C_6$-$C_{60}$ carbocyclic group or a $C_1$-$C_{60}$ heterocyclic group, and ring $CY_{51}$ and ring $CY_{52}$ may be optionally combined with each other with a $C_5$-$C_{60}$ carbocyclic group unsubstituted or substituted with at least one $R_{50b}$ or a $C_1$-$C_{60}$ heterocyclic group unsubstituted or substituted with at least one $R_{50b}$ therebetween, $L_5$ in Formula 5 may be a single bond, O, S, $N(R_{50c})$, $C(R_{50c})(R_{50d})$, or $Si(R_{50c})(R_{50d})$, and n5 may be 0 or 1, wherein, when n5 is 0, $L_5$ may not exist, Het1 in Formula 7 may be a π electron-deficient nitrogen-containing $C_1$-$C_{60}$ cyclic group, and a11, a91 and m in Formulae 7 and 9 may each independently be an integer from 1 to 10, In Formula 9, $X_{101}$ may be N or $C(R_{101})$, $X_{102}$ may be N or $C(R_{102})$, $X_{103}$ may be N or $C(R_{103})$, and at least two of $X_{101}$ to $X_{103}$ may be N, and $X_{91}$ in Formula 9 may be a single bond, O, S, $N(R_{91a})$, $C(R_{91a})(R_{91b})$, or $Si(R_{91a})(R_{91b})$.

The term "π electron-deficient nitrogen-containing $C_1$-$C_{60}$ cyclic group" as used herein refers to a cyclic group having 1 to 60 carbon atoms including at least one *—N═*' as a ring-constituting moiety, and may be, for example, a) a first ring, b) a condensed ring in which two or more first rings are condensed with each other, or c) a condensed ring in which at least one first ring is condensed with at least one second ring. The first ring and the second ring are the same as described in the present specification.

The π electron-deficient nitrogen-containing $C_1$-$C_{60}$ cyclic group may be, for example, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a benzonaphthofuran group, a benzonaphthothiophene group, an (indolo)phenanthrene group, a (benzofurano)phenanthrene group, a (benzothieno)phenanthrene group, or a pyridopyrazine group.

The term "π electron-rich $C_3$-$C_{60}$ cyclic group" used herein refers to a cyclic group having 3 to 60 carbon atoms not including *—N═* as a ring-constituting moiety, and may be, for example, a) a second ring or b) a condensed cyclic group in which two or more second rings are condensed with each other. The second ring are the same as described in the present specification.

The n electron-rich $C_3$-$C_{60}$ cyclic group may be, for example, a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, a pyrrolophenanthrene group, a furanophenanthrene group, or a thienophenanthrene group.

In some embodiments, $Ar_1$, $Ar_2$, $Ar_{11}$, $Ar_{101}$ and $Ar_{102}$ in Formulae 5, 7 and 9 may each independently be a group derived from i) a first ring unsubstituted or substituted with at least one $R_{50}$, ii) a second ring unsubstituted or substituted with at least one $R_{50}$, iii) a condensed cyclic group in which two or more first rings, substituted or unsubstituted with at least one $R_{50}$, are condensed with each other, iv) a condensed cyclic group in which two or more second rings, substituted or unsubstituted with at least one $R_{50}$, are condensed with each other, or v) a condensed cyclic group in which at least one first ring unsubstituted or substituted with at least one $R_{50}$ is condensed with at least one second ring unsubstituted or substituted with at least one $R_{50}$, $Ar_{91}$ in Formula 9 may be a single bond, or a group derived from i) a first ring unsubstituted or substituted with at least one $R_{90}$, ii) a second ring unsubstituted or substituted with at least one $R_{90}$, iii) a condensed cyclic group in which two or more first rings, unsubstituted or substituted with at least one $R_{90}$, are condensed with each other, iv) a condensed cyclic group in which two or more second rings, unsubstituted or substituted with at least one $R_{90}$, are condensed with each other, or v) a condensed cyclic group in which at least one first ring unsubstituted or substituted with at least one $R_{90}$ is condensed with at least one second ring unsubstituted or substituted with at least one $R_{90}$, $Ar_5$ and $Ar_{12}$ in Formulae 5 and 7 may each independently be a single bond, or a group derived from i) a first ring unsubstituted or substituted with at least one $R_{50a}$, ii) a second ring unsubstituted or substituted with at least one $R_{50a}$, iii) a condensed cyclic group in which two or more first rings, substituted or unsubstituted with at least one $R_{50a}$, are condensed with each other, iv) a condensed cyclic group in which two or more second rings, substituted or unsubstituted with at least one $R_{50a}$, are condensed with each other, or v) a condensed cyclic group in which at least one first ring unsubstituted or substituted with at least one $R_{50a}$ is condensed with at least one second ring unsubstituted or substituted with at least one $R_{50a}$, or may not exist, ring $CY_{51}$, ring $CY_{52}$, ring $CY_{51}$ and ring $CY_{92}$ in Formulae 5 and 9 may each independently be i) a first ring, ii) a second ring, iii) a condensed ring in which two or more first rings are condensed with each other, iv) a condensed ring in which two or more second rings are condensed with each other, or v) a condensed ring in which one or more first rings and one or more second rings are condensed with each other, Het1 in Formula 7 may be a group derived from i) a first ring, ii) a condensed cyclic group in which two or more first rings are condensed with each other or iii) a condensed cyclic group in which at least one first ring is condensed with at least one second ring, the first ring may be an imidazole group, a pyrazole group, a thiazole group, an isothiazole group, an oxazole group, an isoxazole group, a pyridine group, a pyrazine group, a pyridazine group, a pyrimidine group, a triazole group, a tetrazole group, an oxadiazole group, a triazine group, or a thiadiazole group, and the second ring may be a benzene group, a cyclopentadiene group, a pyrrole group, a furan group, a thiophene group, or a silole group.

In one or more embodiments, $Ar_1$, $Ar_2$, $Ar_{11}$, $Ar_{101}$ and $Ar_{102}$ in Formulae 5, 7, and 9 may each independently be a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a benzonaphthofuran group, a benzonaphthothiophene group, an (indolo)phenanthrene group, a (benzofurano)phenanthrene group, or a (benzothieno)phenanthrene group, each unsubstituted or substituted with at least one $R_{50}$.

In one or more embodiments, $Ar_{91}$ in Formula 9 may be a single bond, or a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a benzonaphthofuran group, a benzonaphthothiophene group, an (an indolo)phenanthrene group, a (benzofurano)phenanthrene group, or a (benzothieno)phenanthrene group, each unsubstituted or substituted with at least one $R_{90}$.

In one or more embodiments, $Ar_5$ and $Ar_{12}$ in Formulae 5 and 7 may each independently be a single bond, or a benzene group, a naphthalene group, or a carbazole group, each unsubstituted or substituted with at least one $R_{50a}$, or may not exist.

In one or more embodiments, ring $CY_{51}$, ring $CY_{52}$, ring $CY_{91}$ and ring $CY_{92}$ of Formulae 5 and 9 may each independently be a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a pyrrolophenanthrene group, a furanophenanthrene group, or a thienophenanthrene group.

In one or more embodiments, Het1 in Formula 7 may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, or a pyridopyrazine group.

In one or more embodiments, $Ar_1$, $Ar_2$, $Ar_{11}$, $Ar_{101}$ and $Ar_{102}$ in Formulae 5, 7, and 9 may each independently be a π electron-rich $C_3$-$C_{50}$ cyclic group unsubstituted or substituted with at least one $R_{50}$.

In one or more embodiments, $Ar_{91}$ in Formula 9 may be a single bond, or a π electron-rich $C_3$-$C_{60}$ cyclic group unsubstituted or substituted with at least one $R_{90}$.

In one or more embodiments, $Ar_5$ and $Ar_{12}$ in Formulae 5 and 7 may each independently be a single bond or a u electron-rich $C_3$-$C_{60}$ cyclic group unsubstituted or substituted with at least one $R_{50a}$, or may not exist.

In one or more embodiments, ring $CY_{51}$, ring $CY_{52}$, ring $CY_{91}$, and ring $CY_{92}$ in Formulae 5 and 9 may each independently be a u electron-rich $C_3$-$C_{60}$ cyclic group.

In one or more embodiments, ring $CY_{91}$ and ring $CY_{92}$ in Formula 9 may each independently be a benzene group, a naphthalene group, a phenanthrene group, a dibenzofuran group, a dibenzothiophene group, a carbazole group, a fluorene group, or a dibenzosilole group.

In one or more embodiments, one of ring $CY_{91}$ and ring $CY_{92}$ in Formula 9 may be a benzene group, a naphthalene group, or a phenanthrene group, and the other one may be a dibenzofuran group, a dibenzothiophene group, a carbazole group, a fluorene group, or a dibenzosilole group.

In one or more embodiments, n6 and p in Formulae 5 and 7 may each independently be 1 or 2.

In one or more embodiments, when n6 in Formula 5 is 1, at least one of ring $CY_{51}$ and ring $CY_{52}$ may not be a benzene group.

In one or more embodiments, when n6 in Formula 5 is 1, at least one of ring $CY_{51}$ and ring $CY_{52}$ may be a) a condensed ring in which two or more first rings are condensed with each other, b) a condensed ring in which two or more second rings are condensed with each other, or c) a condensed ring in which at least one first ring is condensed with at least one second ring. In this regard, the first ring and the second ring are the same as described in the present specification.

In one or more embodiments, the compound represented by Formula 5 may be a compound represented by Formula 5(1):

Formukla 5(1)

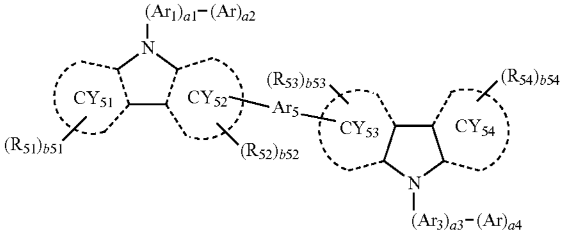

In Formula 5(1), $Ar_5$ may be a single bond, a $C_5$-$C_{60}$ carbocyclic group unsubstituted or substituted with at least one $R_{50a}$, or a $C_1$-$C_{60}$ heterocyclic group unsubstituted or substituted with at least one $R_{50a}$, $Ar_1$, $Ar_2$, $Ar_5$, a1, a2, ring $CY_{51}$, ring $CY_2$, $R_{51}$, $R_{52}$, b51, and b52 are the same as described in the present specification, $Ar_3$ and $Ar_4$ may each independently be a $C_6$-$C_{60}$ carbocyclic group unsubstituted or substituted with at least one $R_{50}$ or a $C_1$-$C_{60}$ heterocyclic group unsubstituted or substituted with at least one $R_{50}$, a3, a4, ring $CY_{53}$, ring $CY_{54}$, $R_{53}$, $R_{54}$, b53, and b54 are the same as described in connection with a1, a2, ring $CY_{51}$, ring $CY_{52}$, $R_{51}$, $R_{52}$, b51, and b52, respectively.

For example, $Ar_5$ in Formula 5(1) may be a single bond.

In one or more embodiments, the compound represented by Formula 7 may include a compound represented by Formula 7(1):

Formula 7(1)

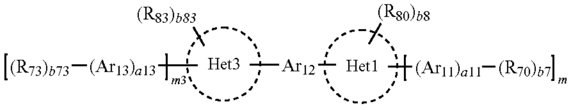

In Formula 7(1), $Ar_{12}$ may be a single bond, a $C_5$-$C_{60}$ carbocyclic group unsubstituted or substituted with at least one $R_{50a}$, or a $C_1$-$C_{60}$ heterocyclic group unsubstituted or substituted with at least one $R_{50a}$, Het1, $Ar_{11}$, $R_{70}$, $R_{80}$, a11, b7, b8, and m are the same as described in the present specification, and Het3, $Ar_{13}$, $R_{73}$, $R_{83}$, a13, b73, b83, and m3 are the same as described in connection with Het1, $Ar_{11}$, $R_{70}$, $R_{80}$, a11, b7, b8, and m, respectively.

In one or more embodiments, a group represented by

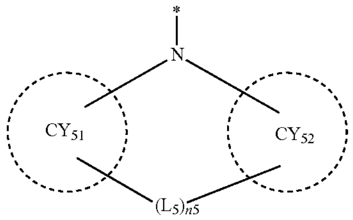

in Formula 5, a group represented by

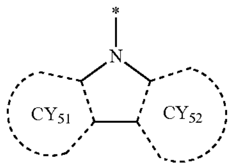

in Formula 5(1) and a group represented by

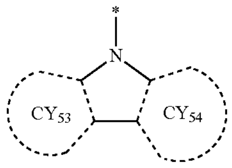

in Formula 5(1) may each independently be a group represented by one of Formulae 2-1 to 2-93:

2-1
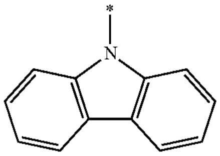
2-2
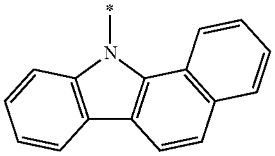
2-3
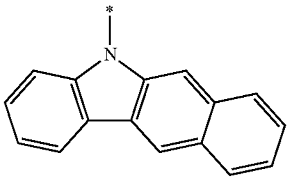
2-4
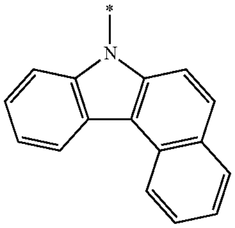
2-5
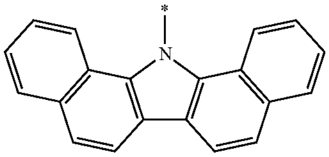
2-6
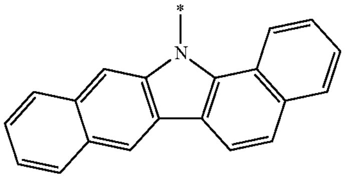
2-7
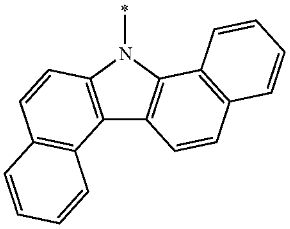
2-8
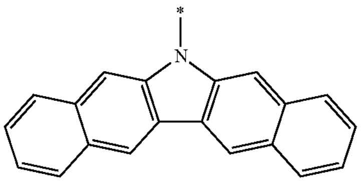
-continued
2-9
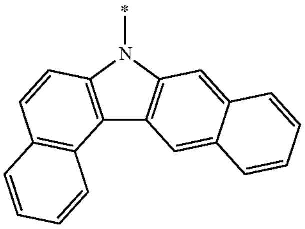
2-10
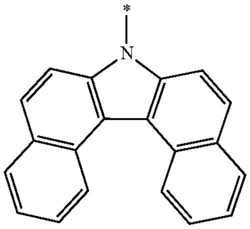
2-11
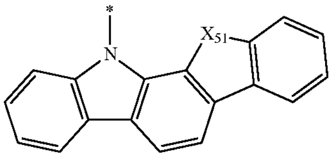
2-12
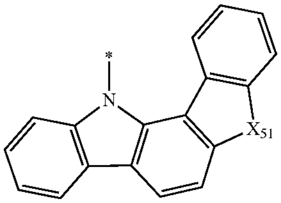
2-13
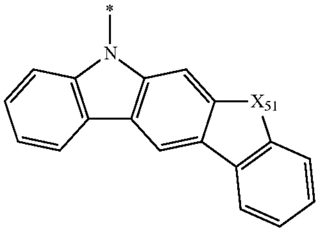
2-14
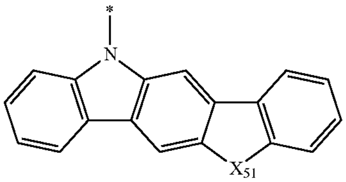
2-15
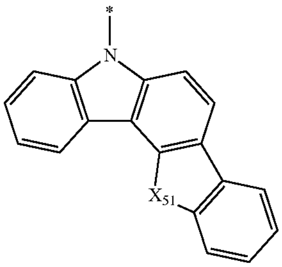

-continued
2-16
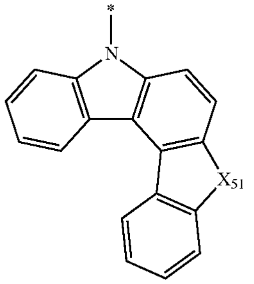
2-17
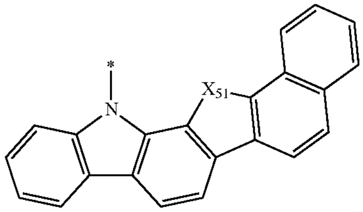
2-18
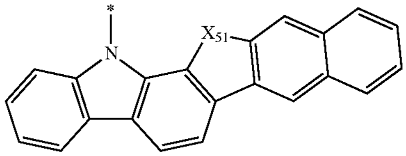
2-19
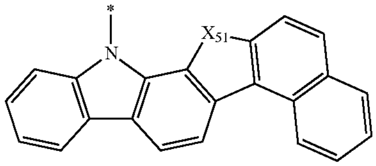
2-20
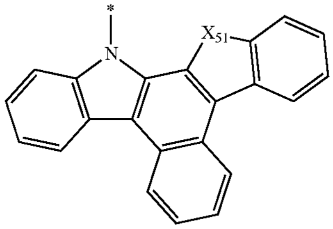
2-21
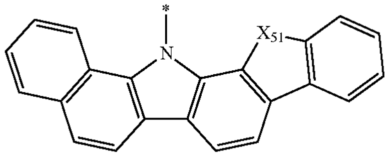
2-22
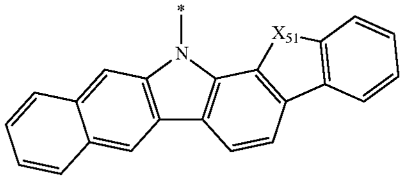
-continued
2-23
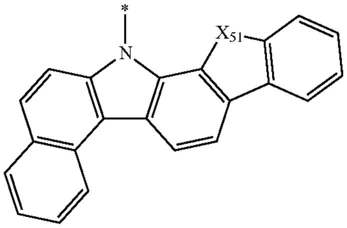
2-24
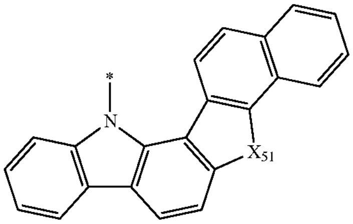
2-25
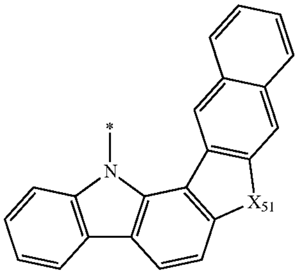
2-26
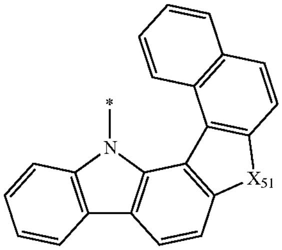
2-27
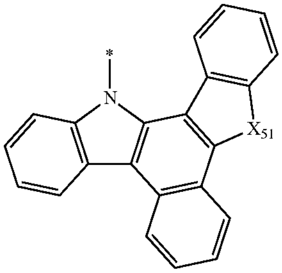
2-28
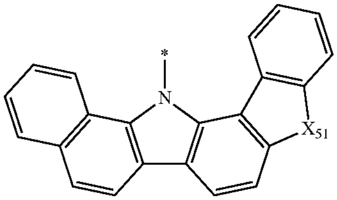

-continued
2-29
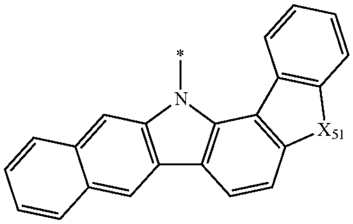
2-30
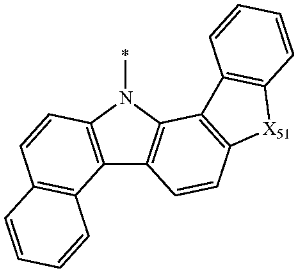
2-31
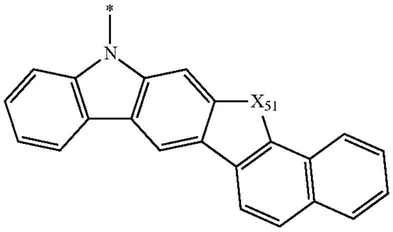
2-32
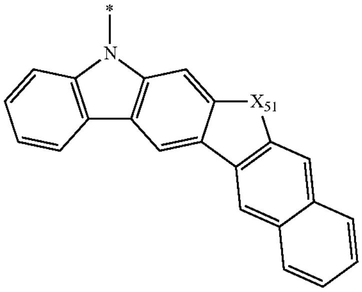
2-33
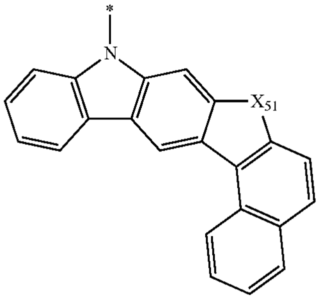
2-34
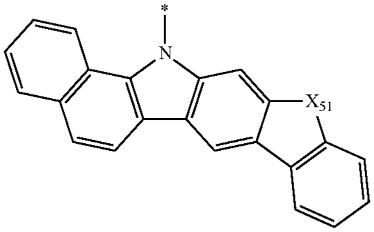
-continued
2-35
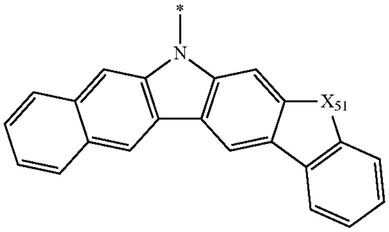
2-36
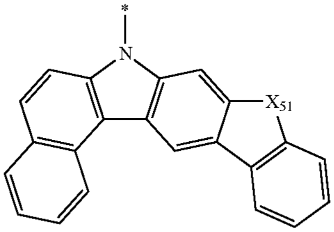
2-37
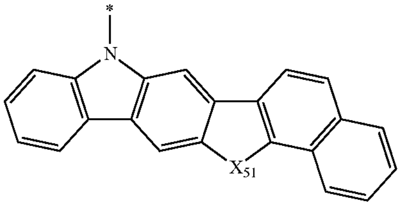
2-38
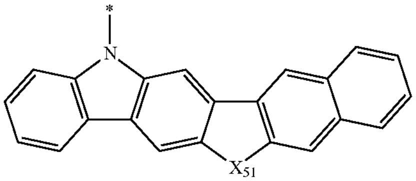
2-39
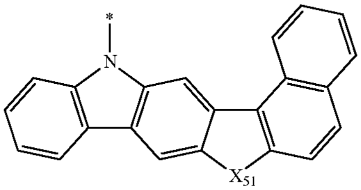
2-40
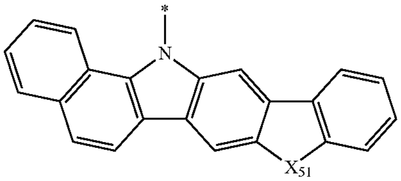
2-41
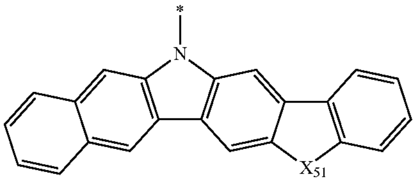

-continued
2-42
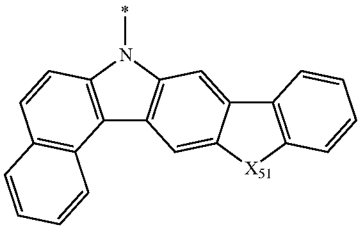
2-43
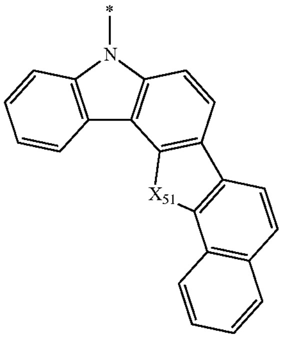
2-44
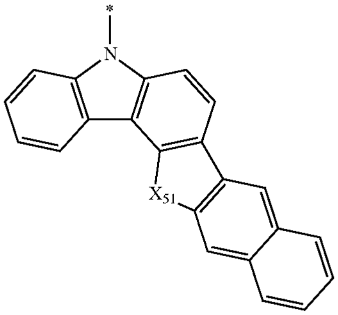
2-45
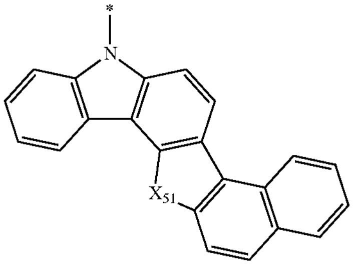
2-46
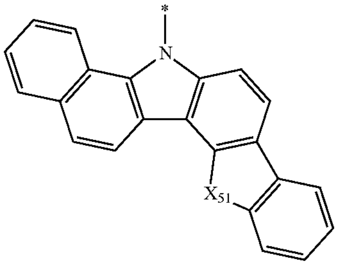
-continued
2-47
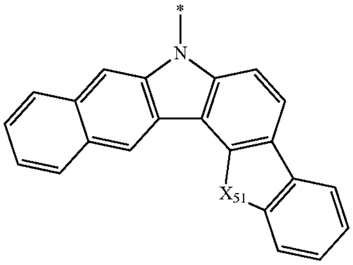
2-48
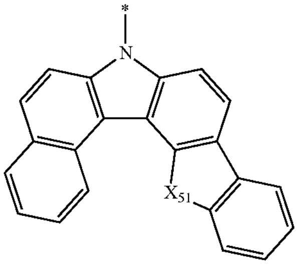
2-49
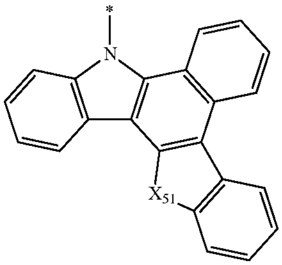
2-50
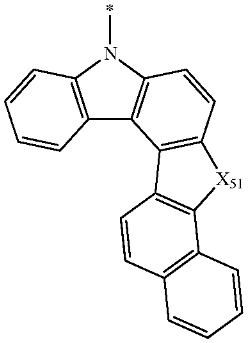
2-51
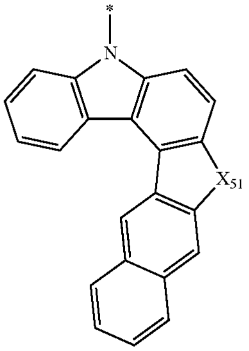

-continued
2-52
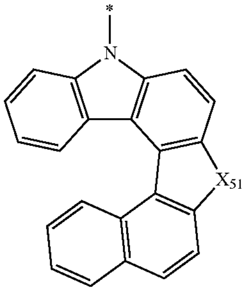
2-53
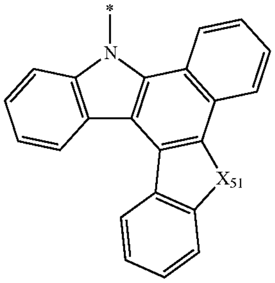
2-54
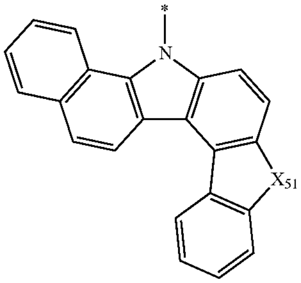
2-55
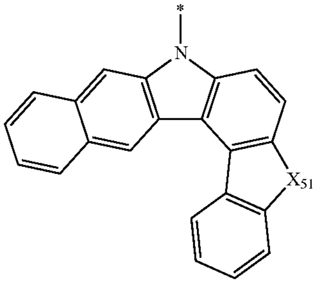
2-56
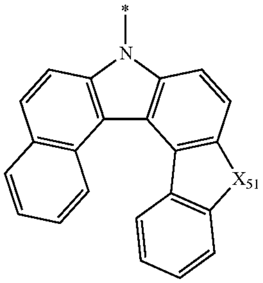
-continued
2-57
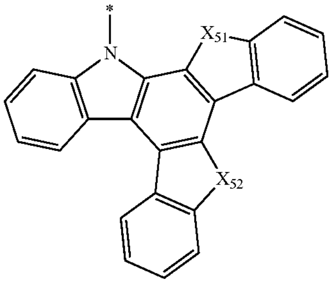
2-58
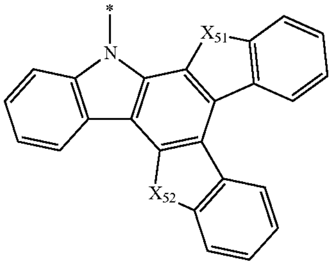
2-59
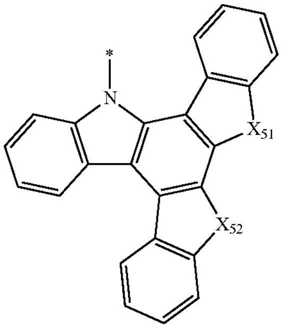
2-60
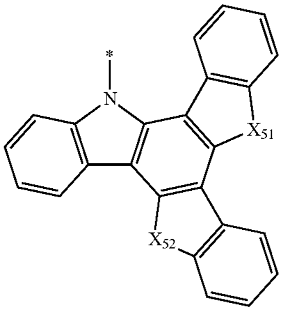
2-61
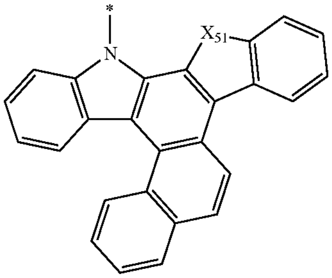

-continued
2-62
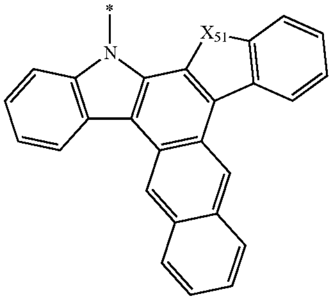
2-63
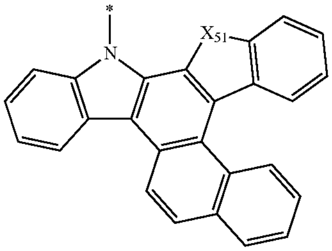
2-64
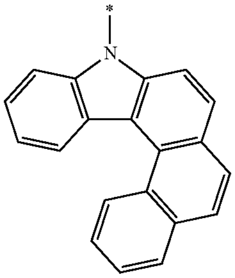
2-65
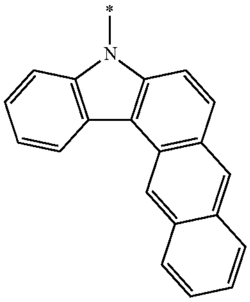
2-66
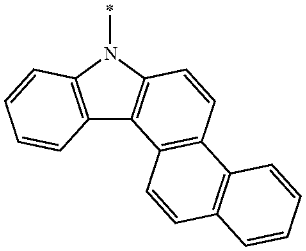
-continued
2-67
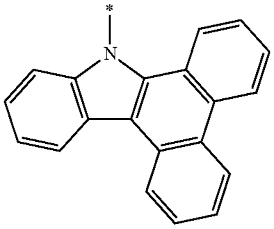
2-68
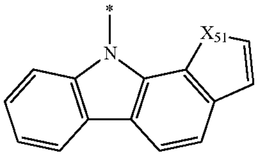
2-69
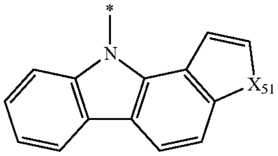
2-70
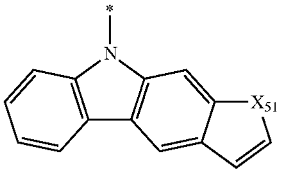
2-71
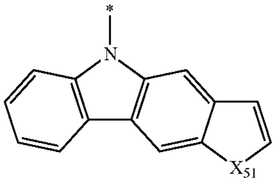
2-72
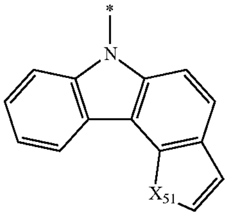
2-73
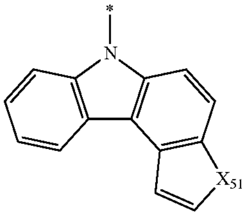
2-74
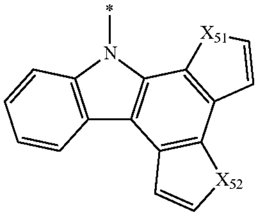

-continued
2-75
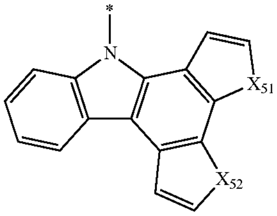
2-76
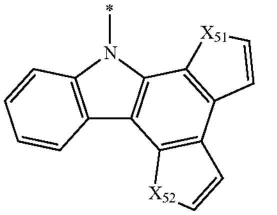
2-77
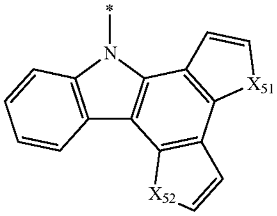
2-78
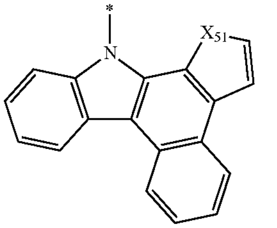
2-79
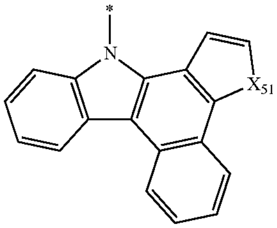
2-80
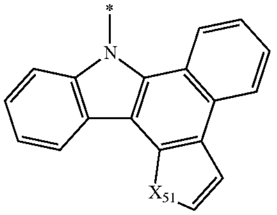
2-81
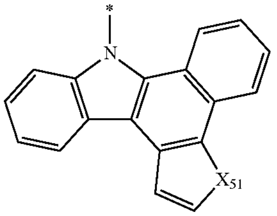
-continued
2-82
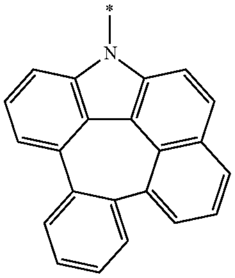
2-83
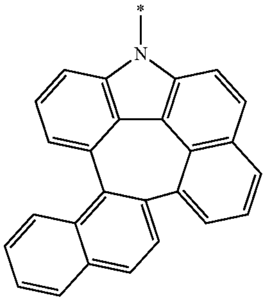
2-84
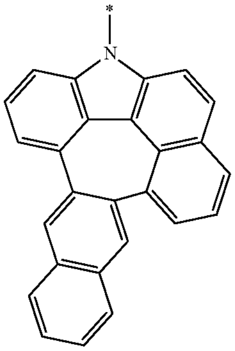
2-85
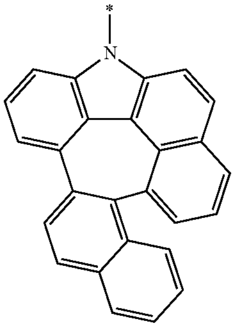
2-86
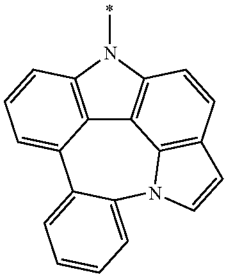

-continued 2-87

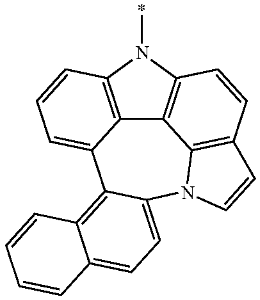

2-88

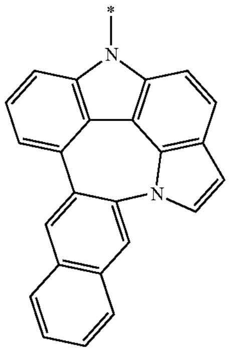

2-89

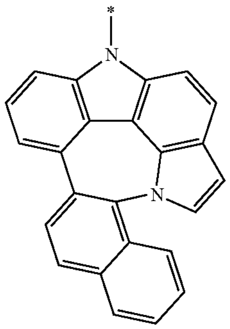

2-90

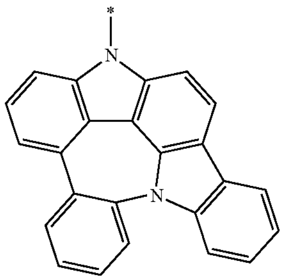

2-91

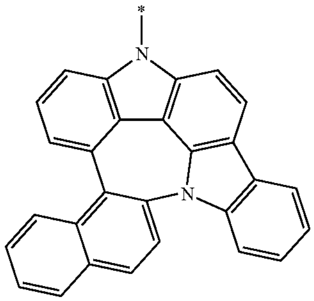

-continued 2-92

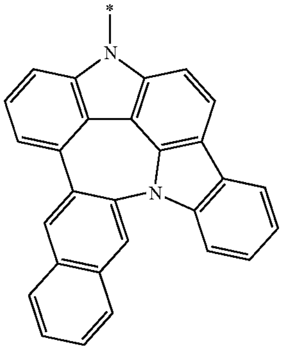

2-93

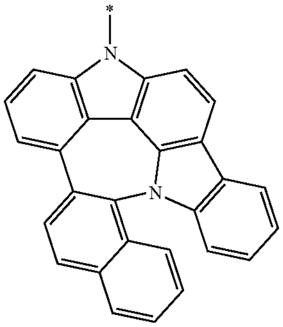

In Formulae 2-1 to 2-93, $X_{51}$ may be O, S, $N(R_{51a})$, $C(R_{51a})(R_{51b})$, or $Si(R_{51a})(R_{51b})$, $X_{52}$ may be O, S, $N(R_{52a})$, $C(R_{52a})(R_{52b})$, or $Si(R_{52a})(R_{52b})$, $R_{51a}$, $R_{51b}$, $R_{52a}$, and $R_{52b}$ are the same as described in connection with $R_{51}$, and

* indicates a binding site to $Ar_1$ or $Ar_2$ in Formula 5 or 5(1).

In one or more embodiments, Het1 in Formula 7 and Het1 and Het3 in Formula 7(1) may each independently be a group derived from one of Formulae 3-1 to 3-40:

3-1

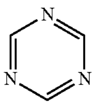

3-2

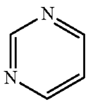

3-3

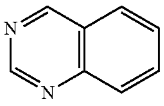

3-4

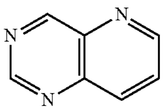

3-5

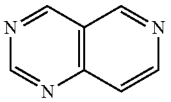

-continued
3-6
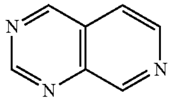
3-7
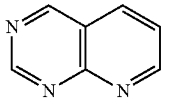
3-8
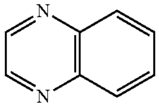
3-9
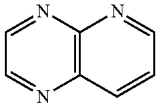
3-10
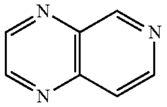
3-11
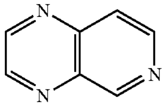
3-12
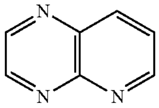
3-13
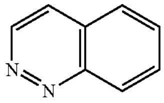
3-14
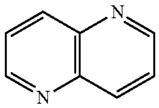
3-15
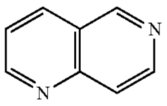
3-16
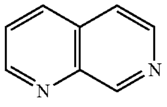
3-17
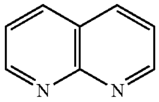
3-18
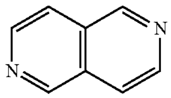
-continued
3-19
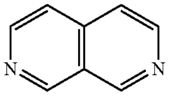
3-20
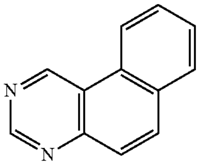
3-21
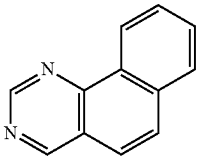
3-22
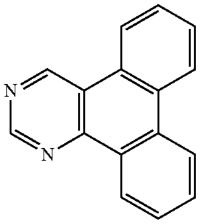
3-23
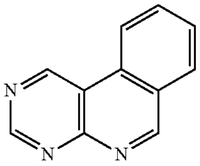
3-24
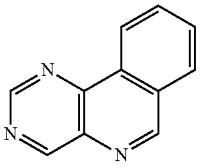
3-25
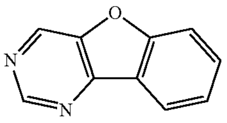
3-26
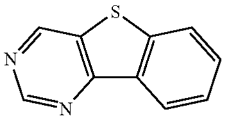
3-27
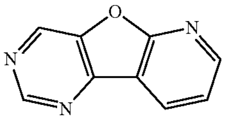
3-28
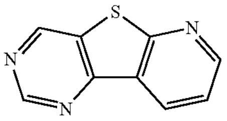

-continued
3-29
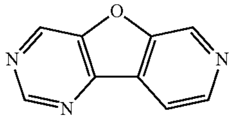
3-30
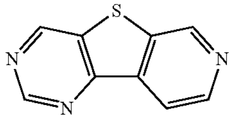
3-31
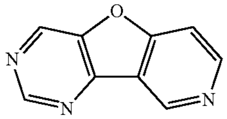
3-32
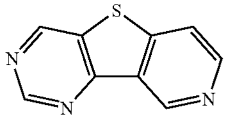
3-33
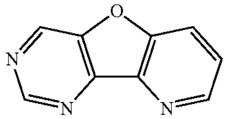
3-34
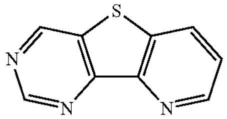
3-35
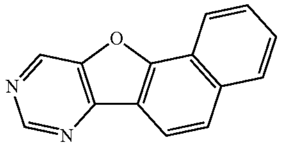
3-36
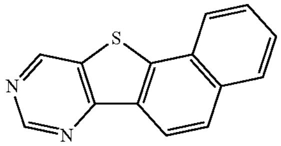
3-37
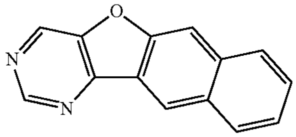
3-38
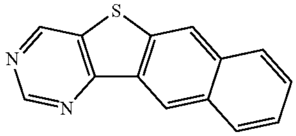
3-39
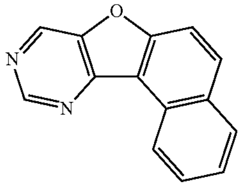
-continued
3-40
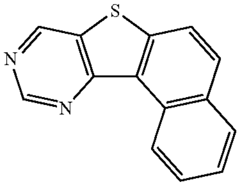
In one or more embodiments, a group represented by
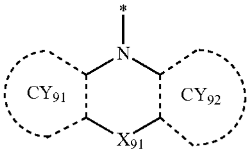
in Formula 9 may be a group represented b one of Formulae 9-1 to 9-6:
9-1
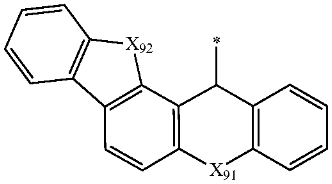
9-2
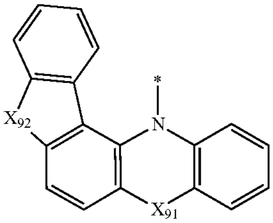
9-3
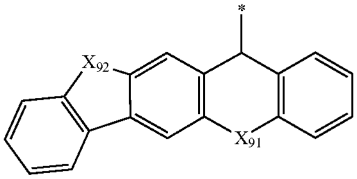
9-4
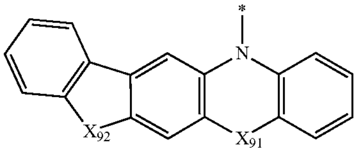
9-5
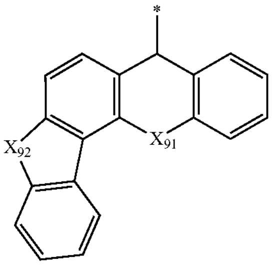

-continued 9-6

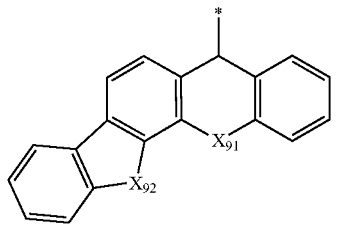

In Formulae 9-1 to 9-6, $X_{91}$ is the same as described above, $X_{92}$ may be O, S, $N(R_{92a})$, $C(R_{92a})(R_{92b})$, or $Si(R_{92a})(R_{92b})$, and

* indicates a binding site to an adjacent atom.

In one or more embodiments, $X_{101}$ to $X_{103}$ in Formula 9 may be N.

a1 and a2 in Formulae 5 and 5(1) may indicate the number of $Ar_1$(s) and the number of $Ar_2$(s), respectively, and may each independently be an integer from 0 to 5 (for example, 0, 1, or 2), and the sum of a1 and a2 may be 1 or more. When a1 is 2 or more, two or more of $Ar_1$(s) may be identical to or different from each other, and when a2 is 2 or more, two or more of $Ar_2$(s) may be identical to each other or different from each other. When a1 is 0, $*-(Ar_1)_{a1}-*'$ in Formula 2 may be a single bond.

a11 and m in Formulae 7 and 7(1) indicate the number of $Ar_{11}$(s) and the number of $*-(Ar_{11})_{a11}-(R_{70})_{a70}$ (s), respectively, and may each independently be an integer from 1 to 10. When a11 is 2 or more, two or more of $Ar_{11}$(s) may be identical to or different from each other, and when m is 2 or more, two or more of $*-(Ar_{11})_{a11}-(R_{70})_{a70}$(s) may be identical to or different from each other.

In one or more embodiments, a11 and m in Formulae 7 and 7(1) may each independently be an integer from 1 to 3.

a91 in Formula 9 indicates the number of $Ar_{91}$(s), and may be an integer from 1 to 10.

$R_{50}$ to $R_{54}$, $R_{50a}$ to $R_{50d}$, $R_{51a}$, $R_{51b}$, $R_{52a}$, $R_{52b}$, $R_{70}$, $R_{73}$, $R_{80}$, $R_{83}$, $R_{90}$ to $R_{92}$, $R_{91a}$, $R_{91b}$, $R_{92a}$, $R_{92b}$, and $R_{101}$ to $R_{103}$ used herein may each independently be hydrogen, deuterium, —F, —Cl, —Br, —I, $-SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $-N(Q_1)(Q_2)$, $-Si(Q_3)(Q_4)(Q_5)$, $-Ge(Q_3)(Q_4)(Q_5)$, $-B(Q_6)(Q_7)$, $-P(=O)(Q_8)(Q_9)$, or $-P(Q_8)(Q_9)$. $Q_1$ to $Q_9$ are the same as described in the present specification.

For example, $R_{50}$ to $R_{54}$, $R_{50a}$ to $R_{50d}$, $R_{51a}$, $R_{51b}$, $R_{52a}$, $R_{52b}$, $R_{70}$, $R_{73}$, $R_{80}$, $R_{83}$, $R_{90}$ to $R_{92}$, $R_{91a}$, $R_{91b}$, $R_{92a}$, $R_{92b}$ and $R_{101}$ to $R_{103}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $-SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $-CD_3$, $-CD_2H$, $-CDH_2$, $-CF_3$, $-CF_2H$, $-CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a fluorinated $C_1$-$C_{20}$ alkyl group, a cyclopentyl group, a cyclohexyl group, a cycloheptyl group, a cyclooctyl group, an adamantanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group (norbornanyl group), a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof;

a cyclopentyl group, a cyclohexyl group, a cycloheptyl group, a cyclooctyl group, an adamantanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$, wherein $Q_1$ to $Q_9$ are each independently:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or any combination thereof.

b51 to b54, b7, b73, b8, b83, b91, and b92 indicates the numbers of $R_{51}$ to $R_{54}$, $R_{70}$, $R_{73}$, $R_{80}$, $R_{83}$, $R_{91}$, and $R_{92}$, respectively, and may each independently be an integer from 0 to 20. For example, b51 to b54, b7, b73, b8, b83, b91, and b92 may each independently be an integer from 0 to 10. when b51 is 2 or more, two or more of $R_{51}$(s) may be identical to or different from each other, when b52 is 2 or more, two or more of $R_{52}$(s) may be identical to or different from each other, when b53 is 2 or more, two or more of $R_{53}$(s) may be identical to or different from each other, when b54 is 2 or more, two or more of $R_{54}$(s) may be identical to or different from each other, when b7 is 2 or more, two or more of $R_{70}$(s) may be identical to or different from each other, when b73 is 2 or more, two or more of $R_{73}$(s) may be identical to or different from each other, when b8 is 2 or more, two or more of $R_{80}$(s) may be identical to or different from each other, when b83 is 2 or more, two or more of $R_{83}$(s) may be identical to or different from each other, when b91 is 2 or more, two or more of $R_{91}$(s) may be identical to or different from each other, when b92 is 2 or more, two or more of $R_{92}$(s) may be identical to or different from each other.

For example, $R_{50}$ to $R_{54}$, $R_{50a}$ to $R_{50d}$, $R_{51a}$, $R_{51b}$, $R_{52a}$, $R_{52b}$, $R_{70}$, $R_{73}$, $R_{80}$, $R_{83}$, $R_{90}$ to $R_{92}$, $R_{91a}$, $R_{91b}$, $R_{92a}$, $R_{92b}$, and $R_{101}$ to $R_{103}$ may each independently be:

hydrogen or deuterium;

a $C_1$-$C_{20}$ alkyl group or a $C_1$-$C_{20}$ alkoxy group, each substituted or unsubstituted with deuterium, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl)carbazolyl group, a dibenzofuranyl group, a dibenzothiophenyl group, a biphenyl group, a terphenyl group, $—N(Q_{31})(Q_{32})$, or any combination thereof;

a π electron-rich $C_3$-$C_{60}$ cyclic group, unsubstituted or substituted with deuterium, a $C_1$-$C_{20}$ alkyl group, a $C_1$-$C_{20}$ alkoxy group, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl)carbazolyl group, a dibenzofuranyl group, a dibenzothiophenyl group, a biphenyl group, a terphenyl group, $—N(Q_{31})(Q_{32})$, or any combination thereof; or $—N(Q_1)(Q_2)$.

In this regard, $Q_1$, $Q_2$, $Q_{31}$, and $Q_{32}$ are the same as described in the present specification.

In one or more embodiments, $R_{50}$ to $R_{54}$, $R_{50a}$ to $R_{50d}$, $R_{51a}$, $R_{51b}$, $R_{52a}$, $R_{52b}$, $R_{70}$, $R_{73}$, $R_{80}$, $R_{93}$, $R_{90}$ to $R_{92}$, $R_{91a}$, $R_{91b}$, $R_{92a}$, $R_{92b}$, and $R_{101}$ to $R_{103}$ may each independently be:

hydrogen or deuterium;

a $C_1$-$C_{20}$ alkyl group unsubstituted or substituted with deuterium, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl)carbazolyl group, a dibenzofuranyl group, a dibenzothiophenyl group, a biphenyl group, a terphenyl group, —N($Q_{31}$)($Q_{32}$), or any combination thereof; or a phenyl group, a naphthyl group, an anthracenyl group, a phenanthrenyl group, a triphenylenyl group, a fluorenyl group, a dibenzosilolyl group, a carbazolyl group, a dibenzofuranyl group, or a dibenzothiophenyl group, each unsubstituted or substituted with deuterium, a $C_1$-$C_{20}$ alkyl group, a $C_1$-$C_{20}$ alkoxy group, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl) carbazolyl group, a ($C_6$-$C_{60}$ aryl)carbazolyl group, a dibenzofuranyl group, a dibenzothiophenyl group, a biphenyl group, a terphenyl group, or any combination thereof.

In this regard, $Q_{31}$ and $Q_{32}$ are the same as described in the present specification.

In Formulae 5, 7, and 9, 1) two or more of $R_{51}$(s) may optionally be combined with each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, 2) two or more of $R_{52}$(s) may optionally be combined with each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, and 3) two or more of ring $CY_{51}$, ring $CY_{52}$, $R_{51}$, and $R_{52}$ may optionally be combined with each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$. $R_{10a}$ may be the same as described in connection with $R_1$.

Description of Examples of Compound

In one or more embodiments, the dopants included in the first emission layer and the second emission layer may be one of compounds of Group 1-1 to Group 1-7:

Group 1-1

1

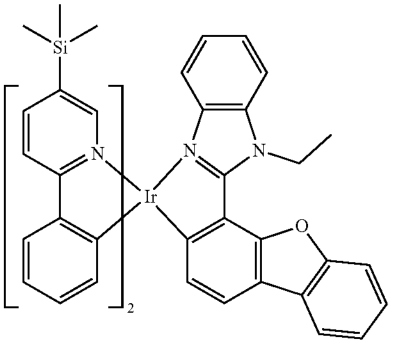

-continued

2

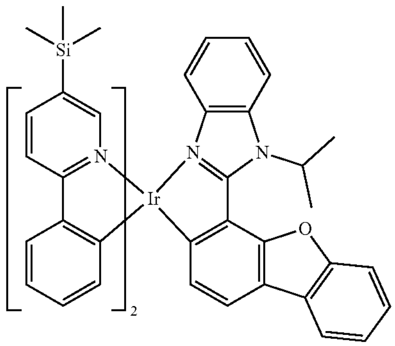

3

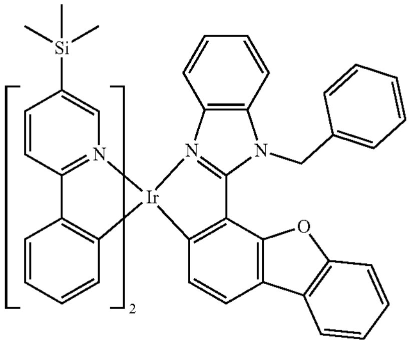

4

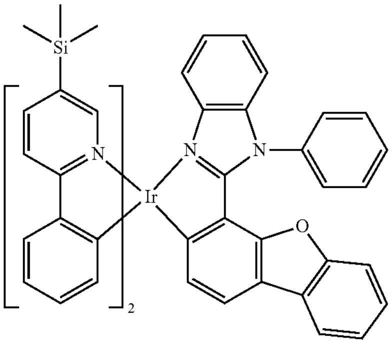

5

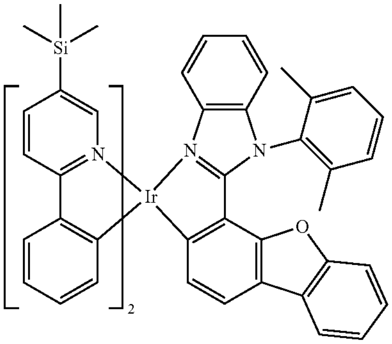

-continued
6
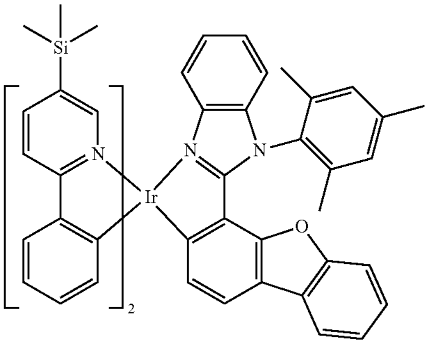
10
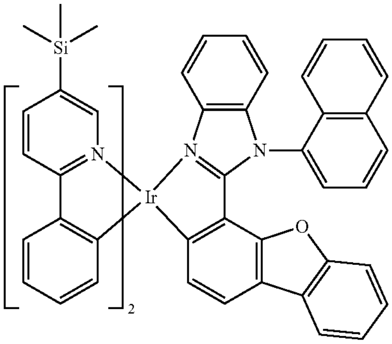
7
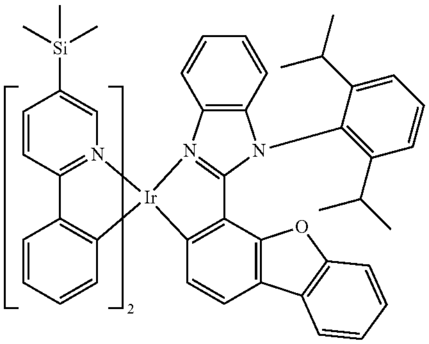
11
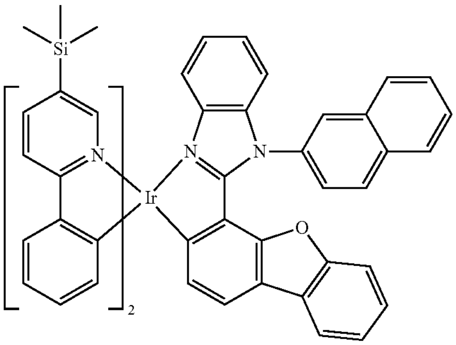
8
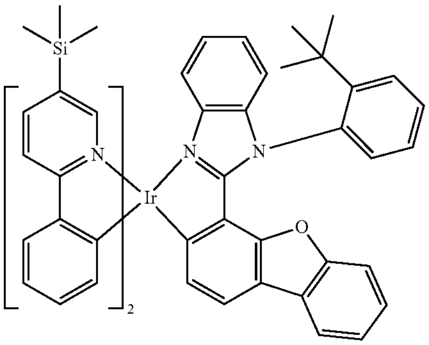
12
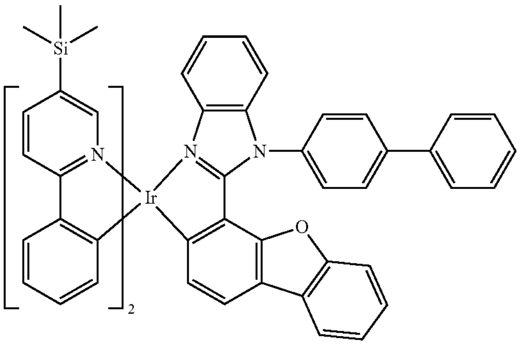
9
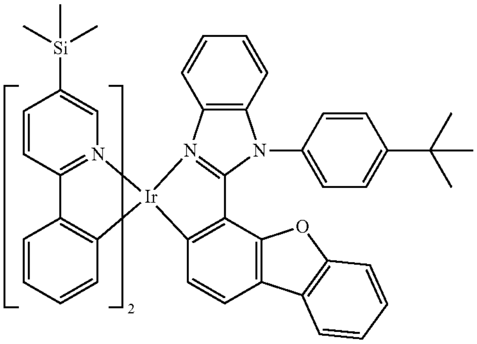
13
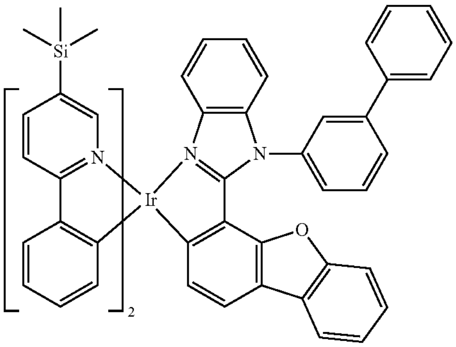

-continued
14
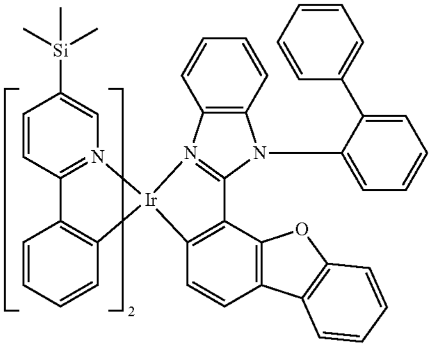
15
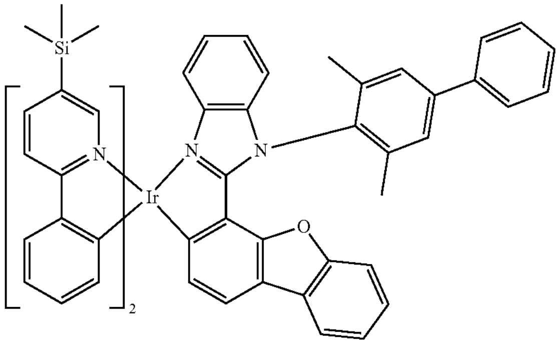
16
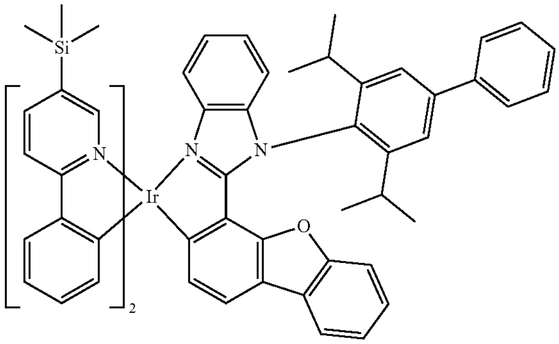
17
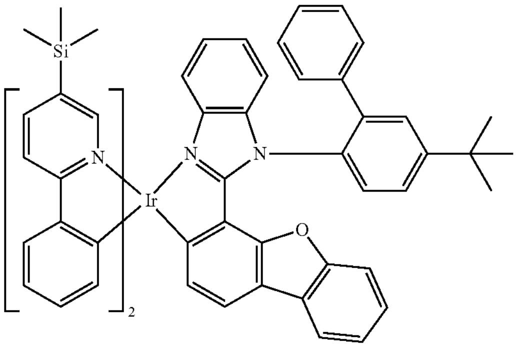
-continued
18
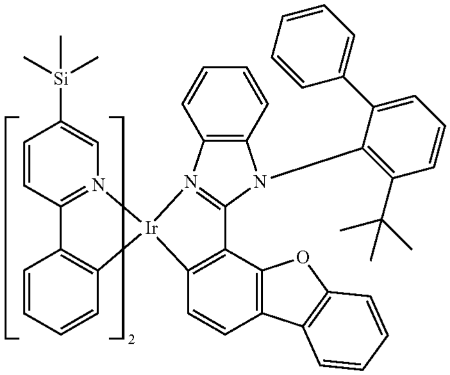
19
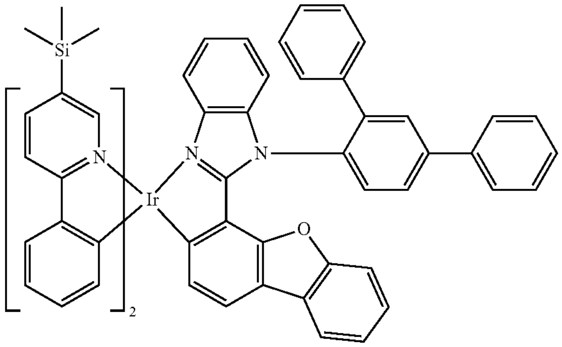
20
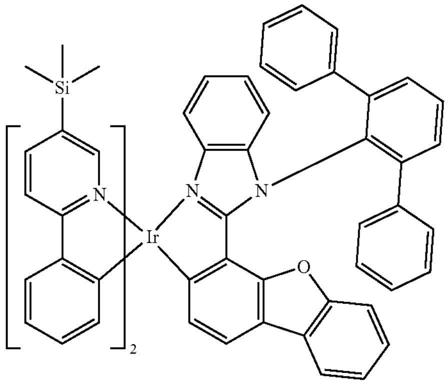
21
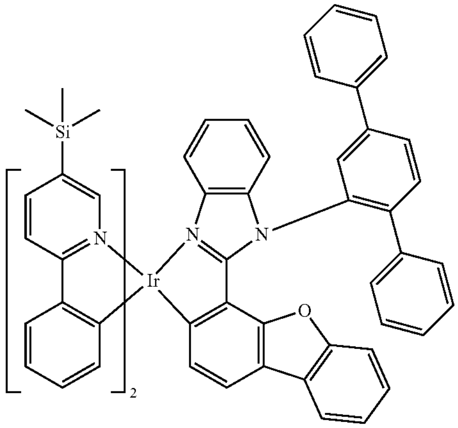

-continued
22
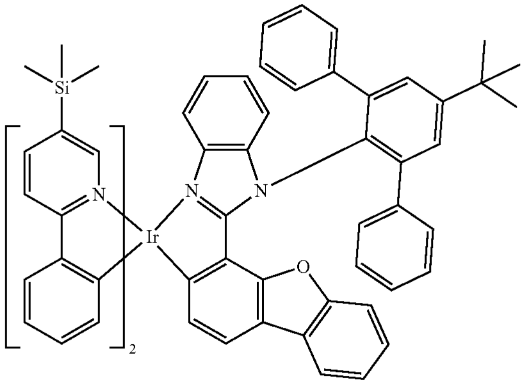
23
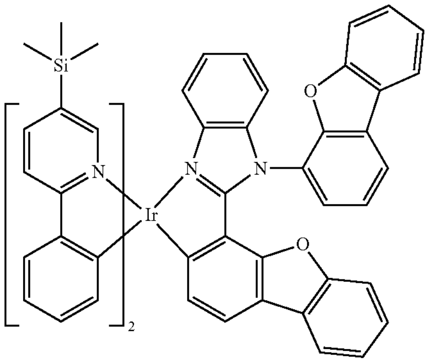
24
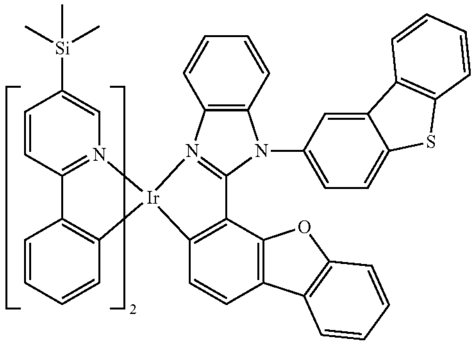
25
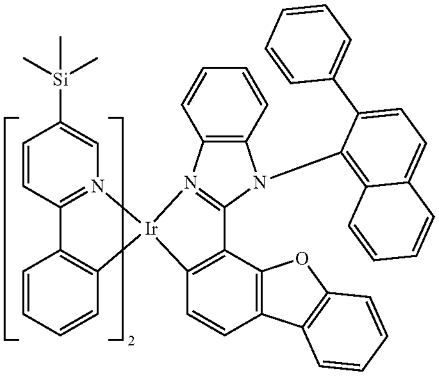
-continued
26
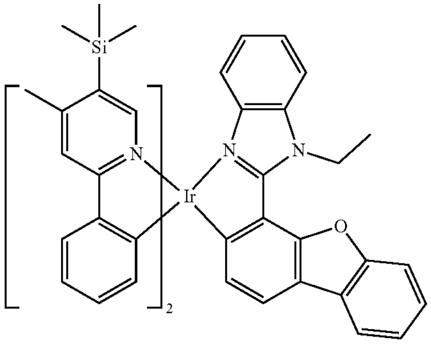
27
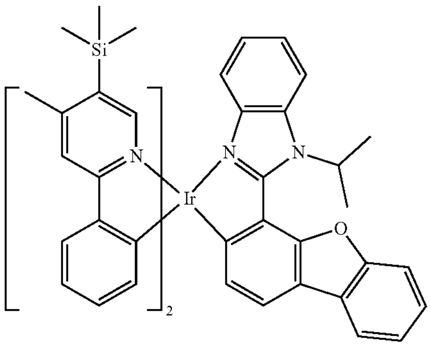
28
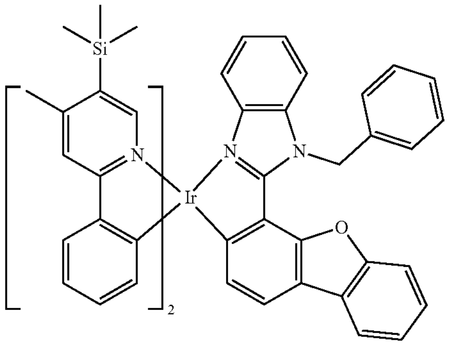
29
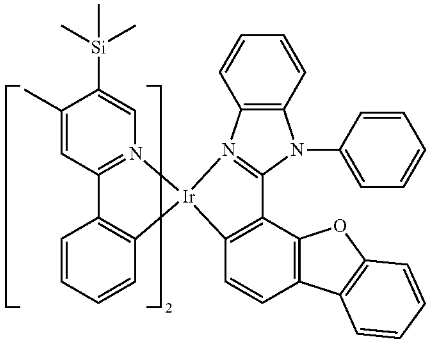

-continued
30
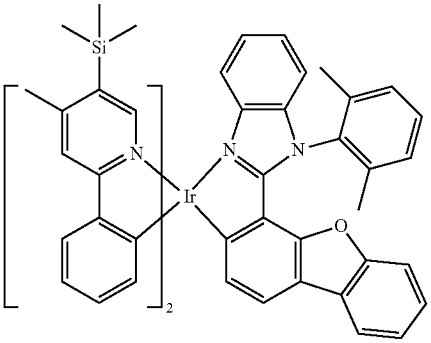
31
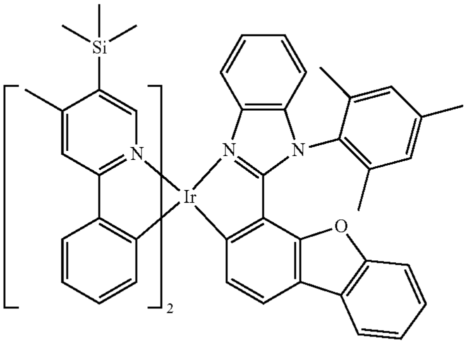
32
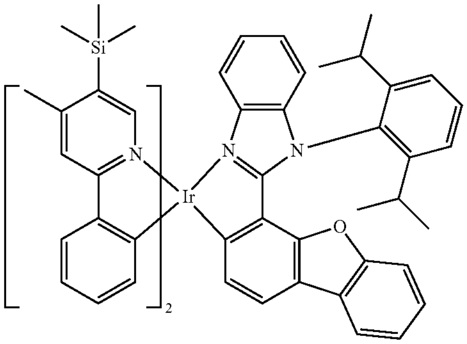
33
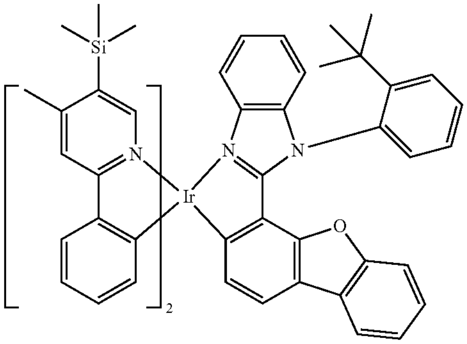
-continued
34
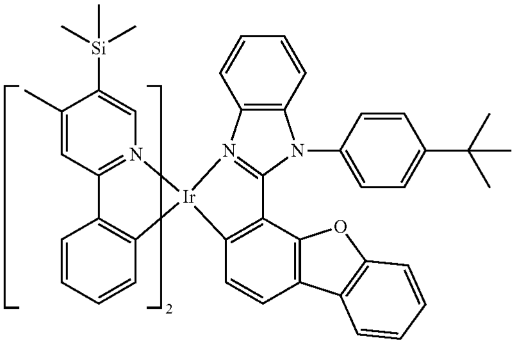
35
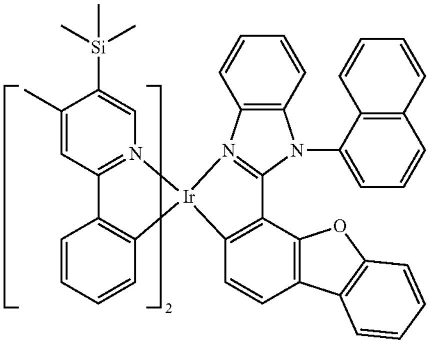
36
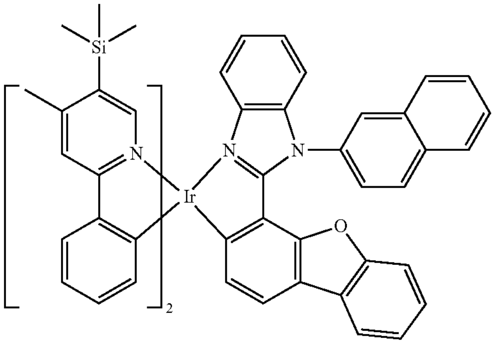
37
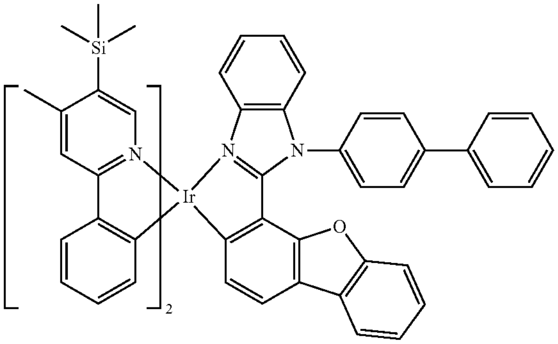

-continued
38
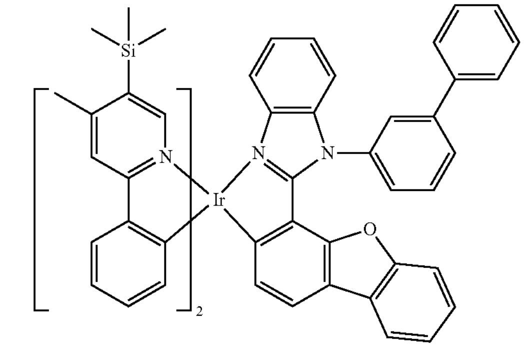
39
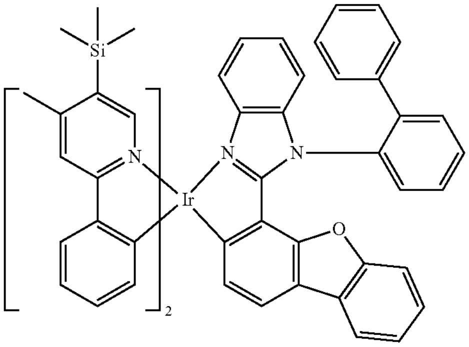
40
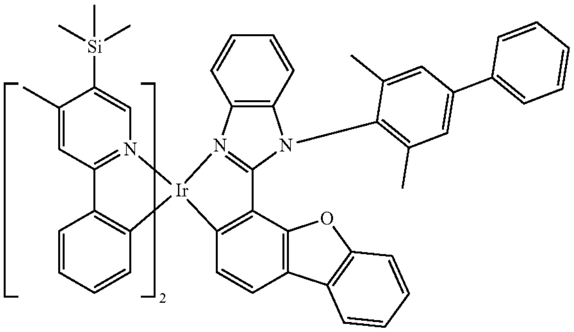
41
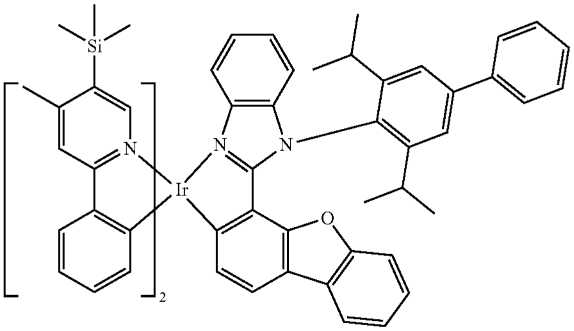
-continued
42
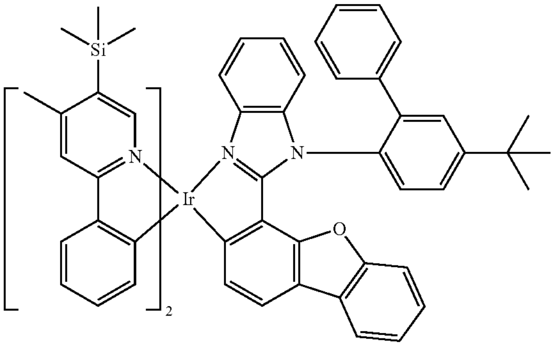
43
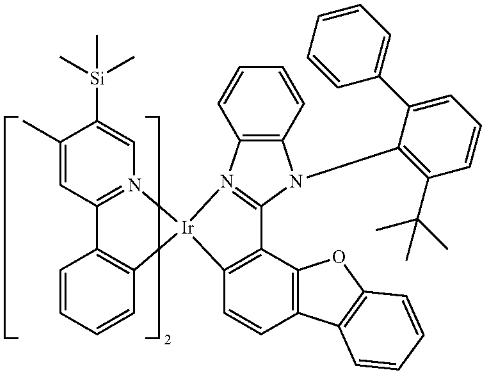
44
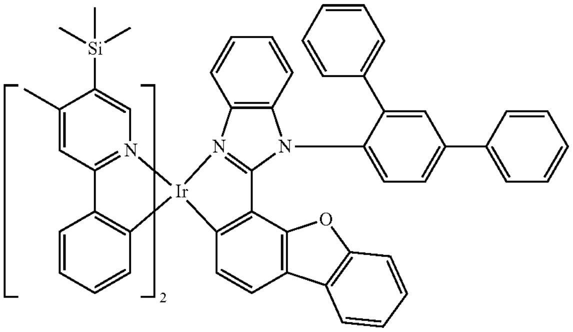
45
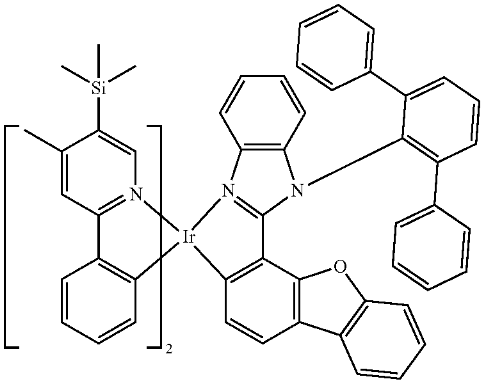

-continued
46
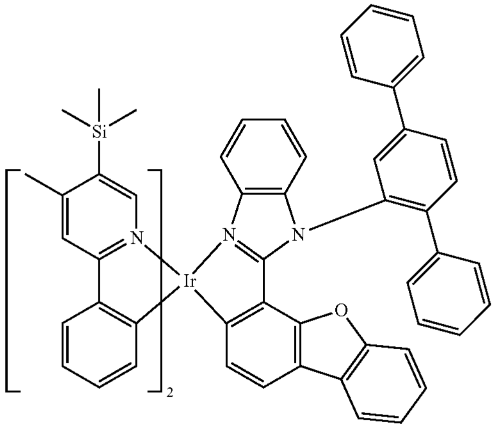
47
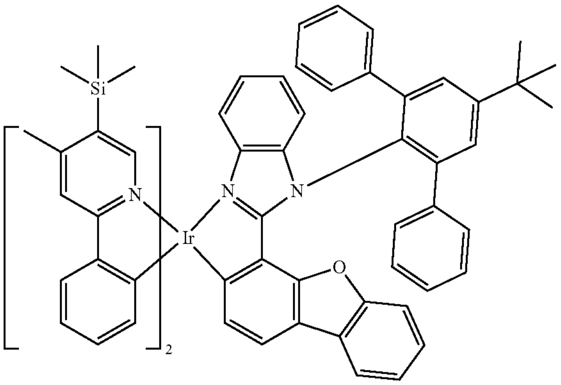
48
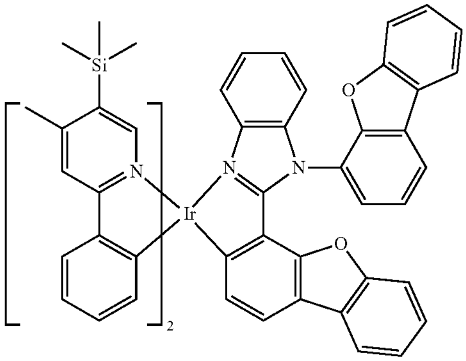
49
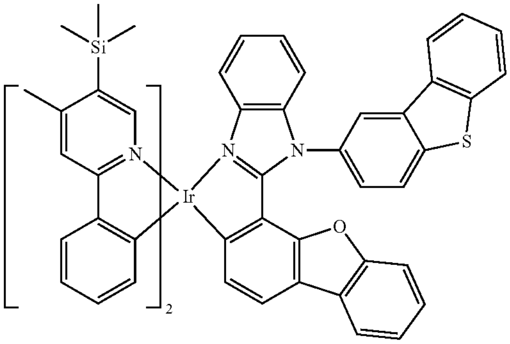
-continued
50
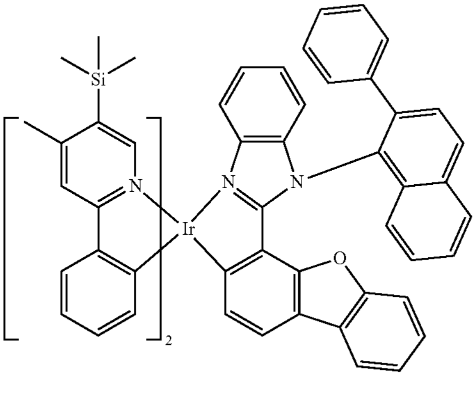
51
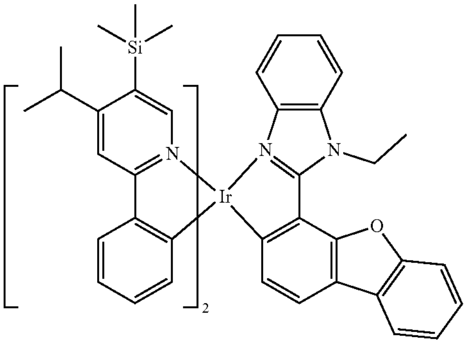
52
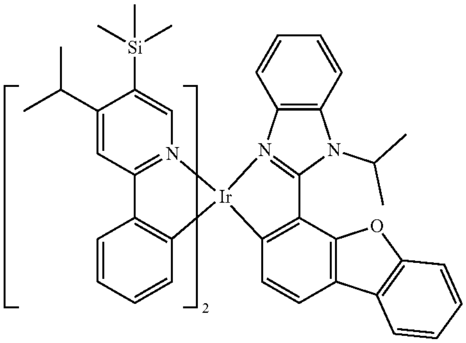
53
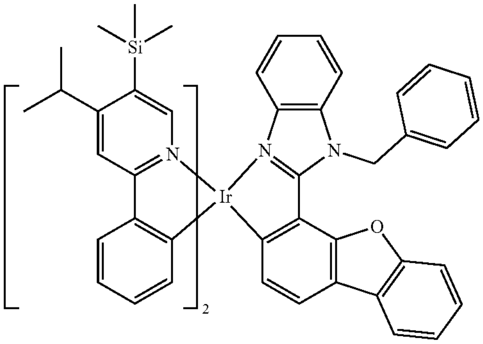

-continued
54
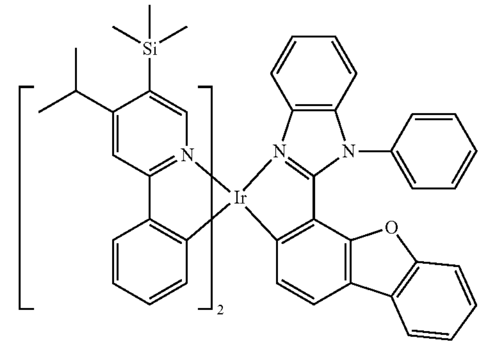
55
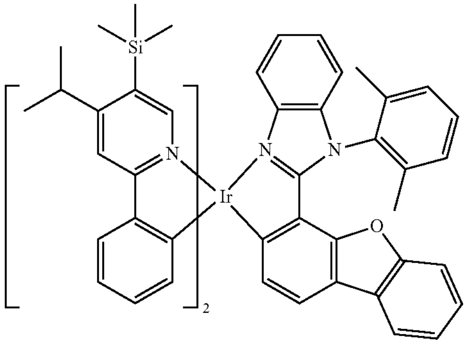
56
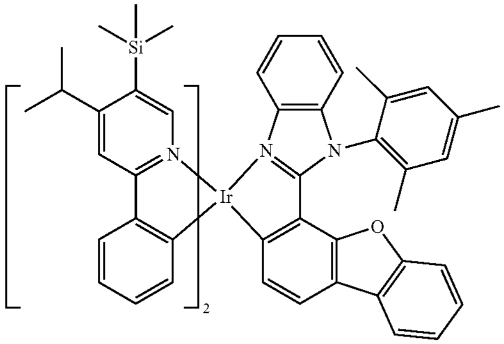
57
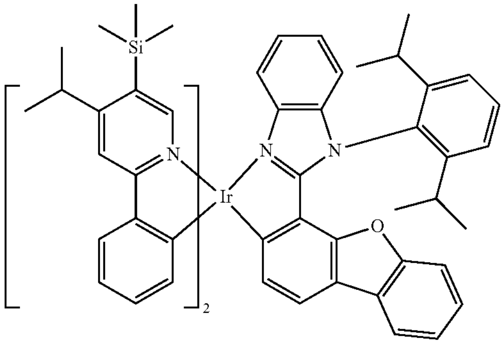
-continued
58
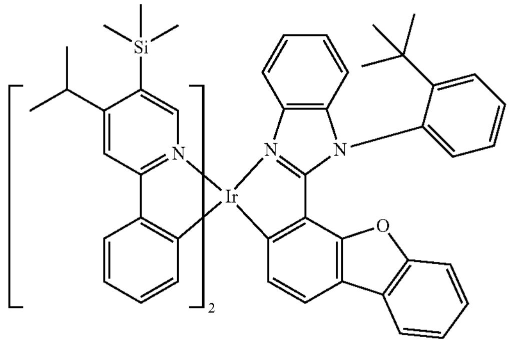
59
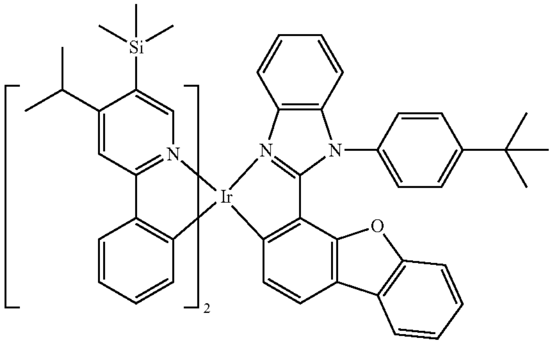
60
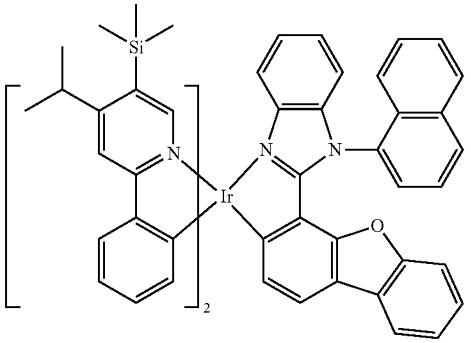
61
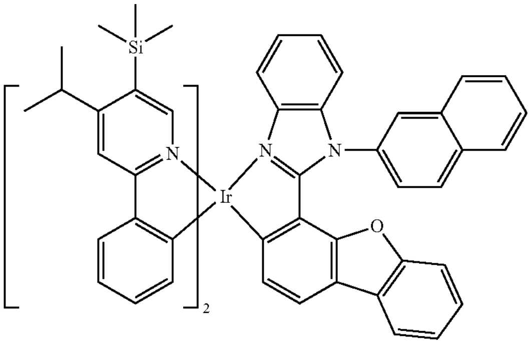

-continued
62
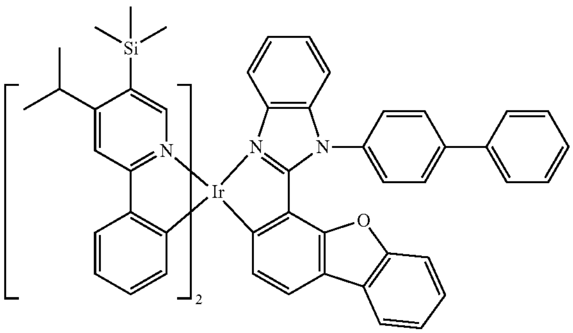
63
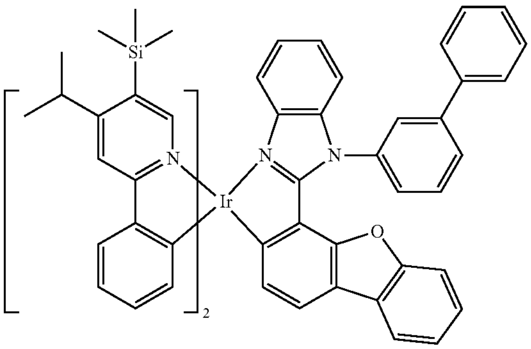
64
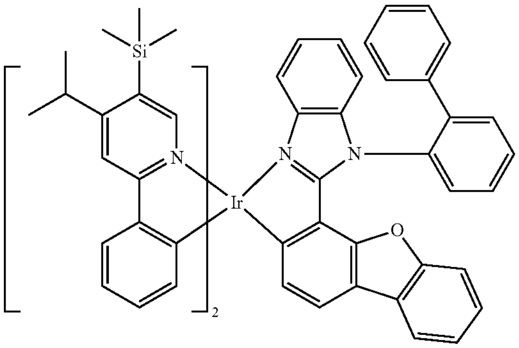
65
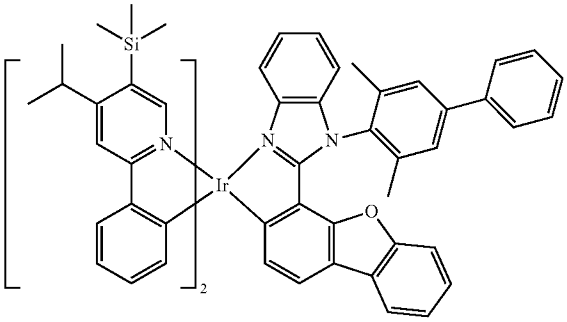
-continued
66
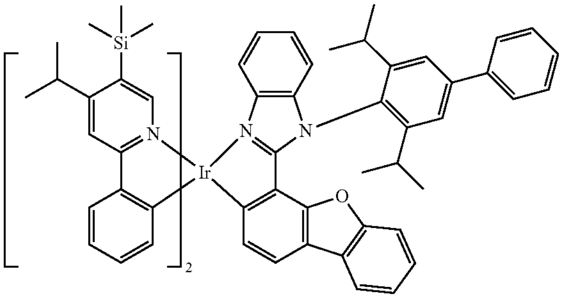
67
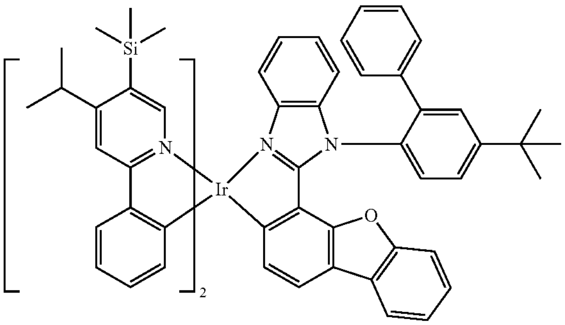
68
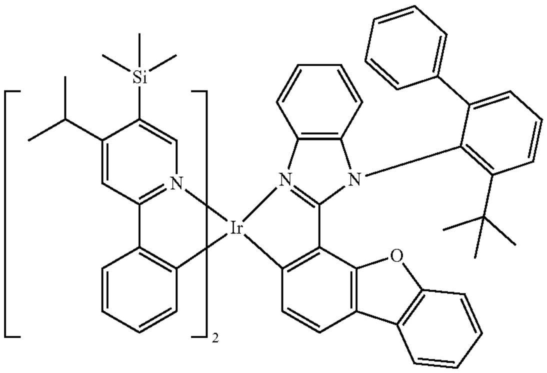
69
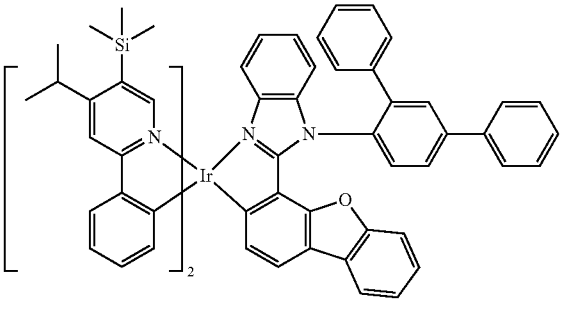

-continued
70
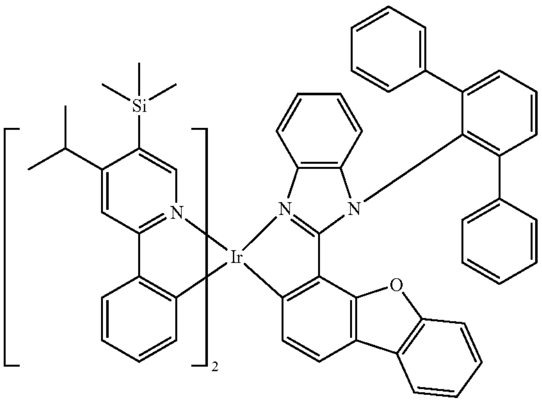
71
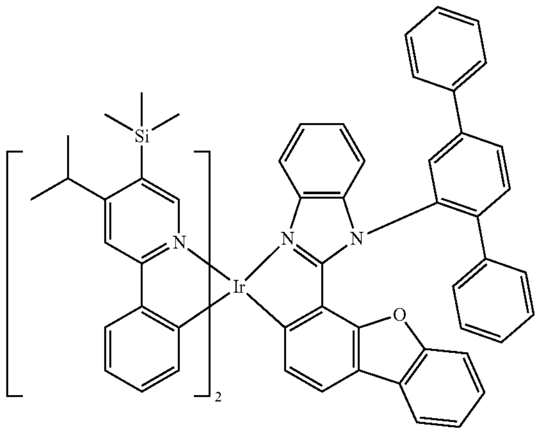
72
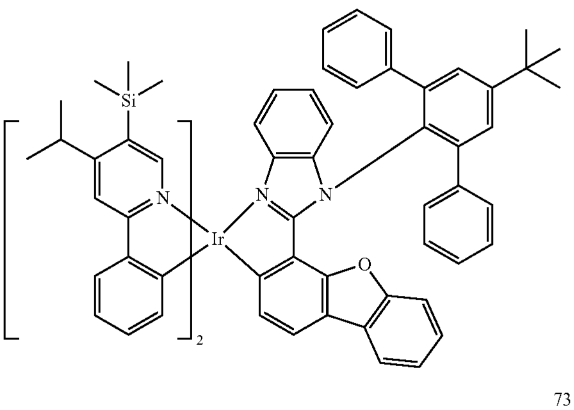
73
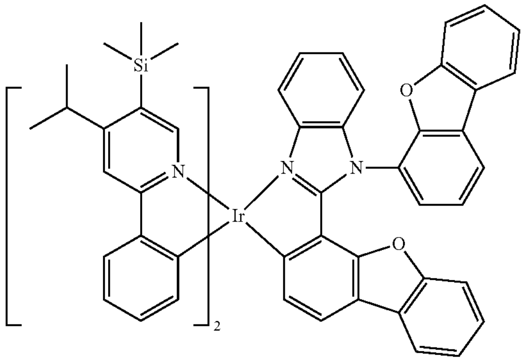
-continued
74
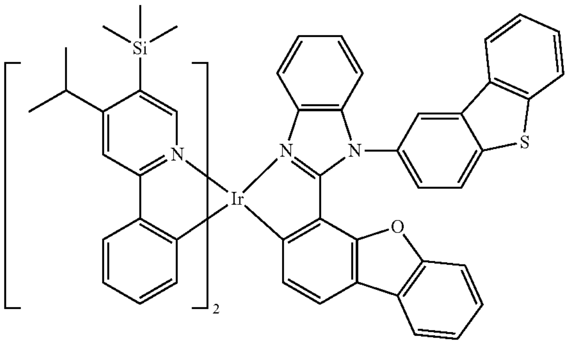
75
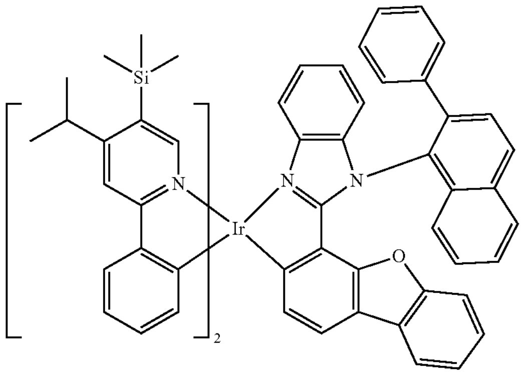
76
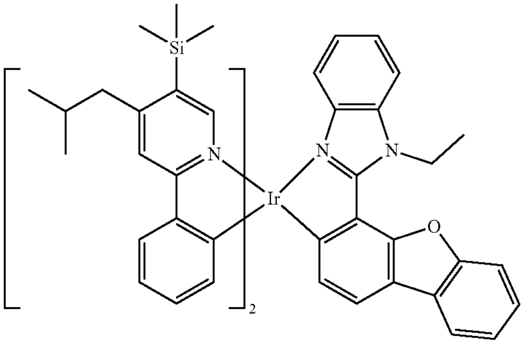
77
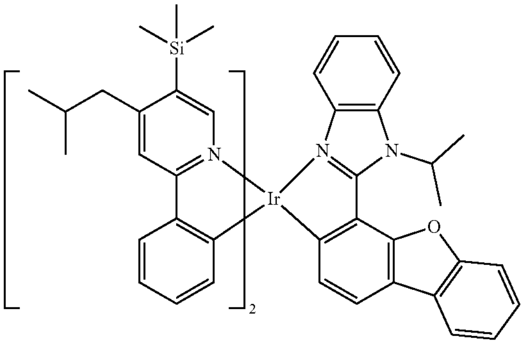

-continued
78
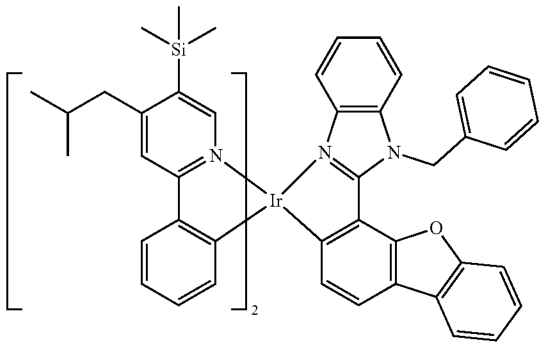
79
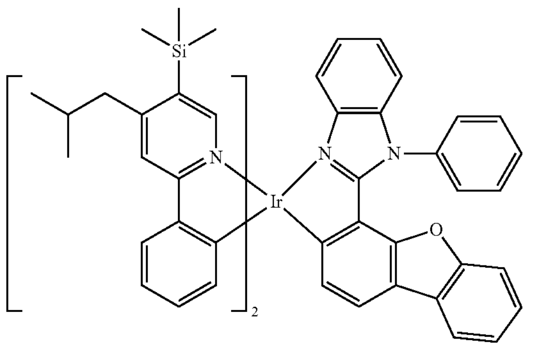
80
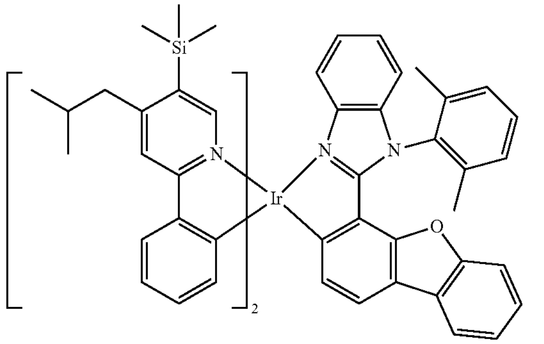
81
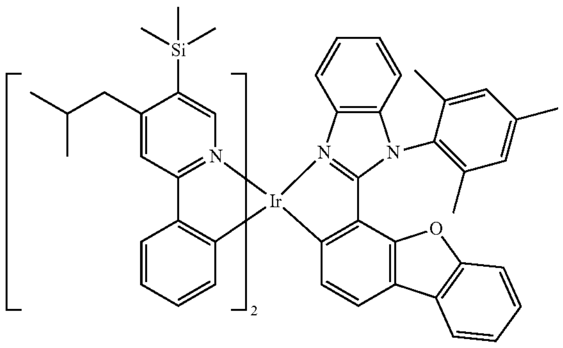
-continued
82
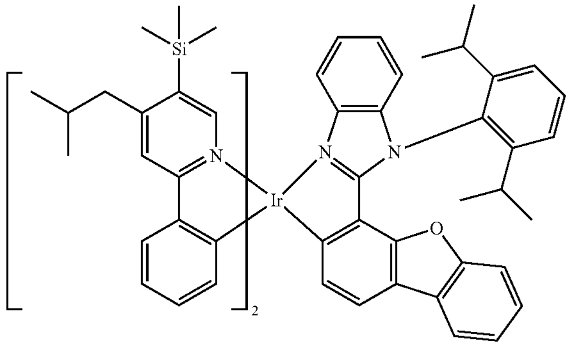
83
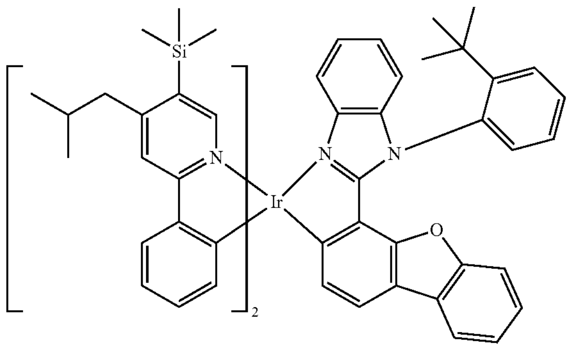
84
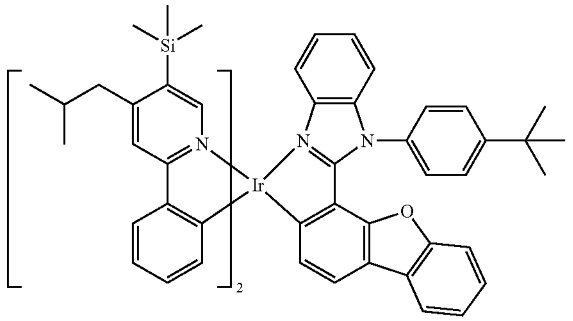
85
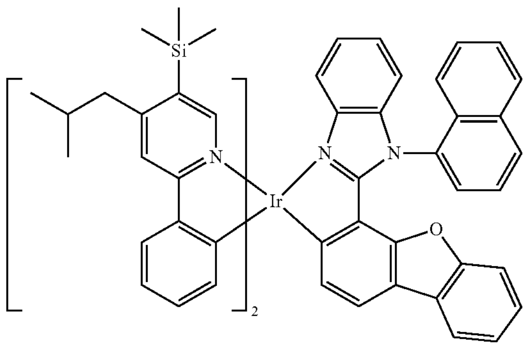

-continued
86
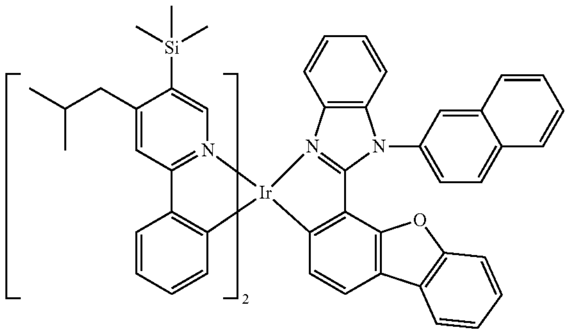
87
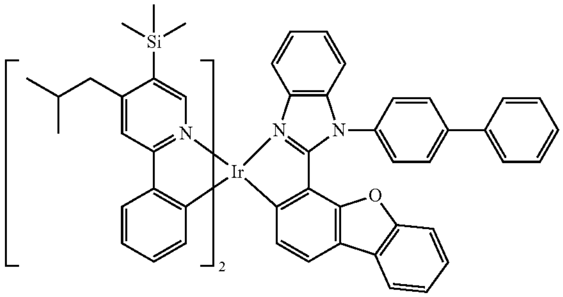
88
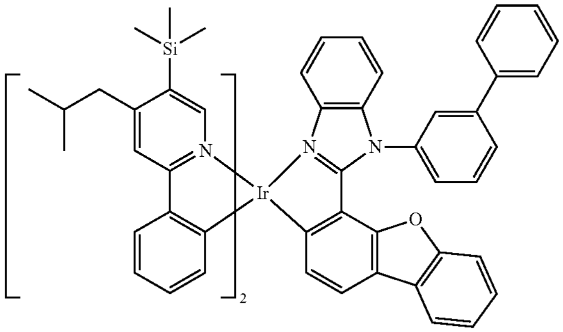
89
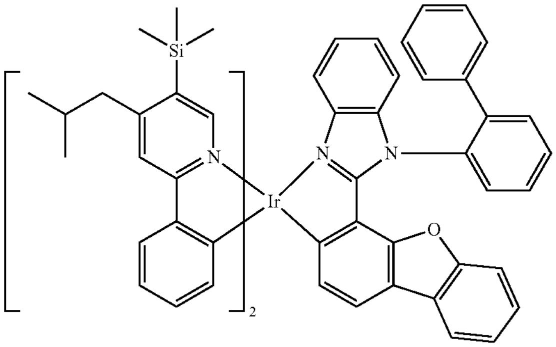
-continued
90
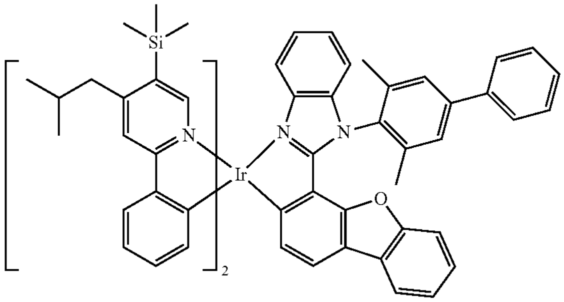
91
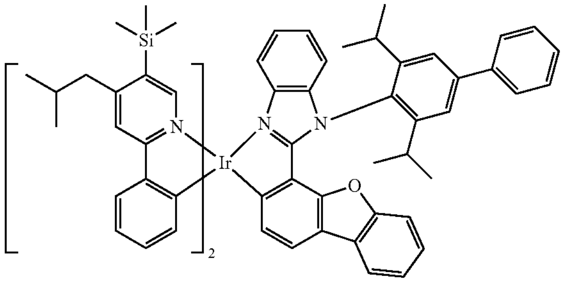
92
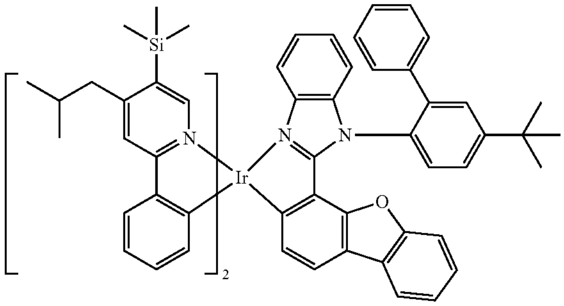
93
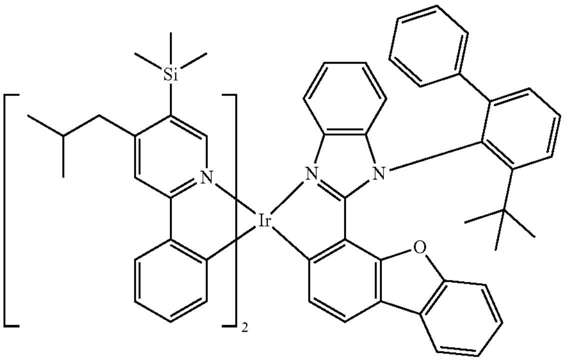

-continued
94
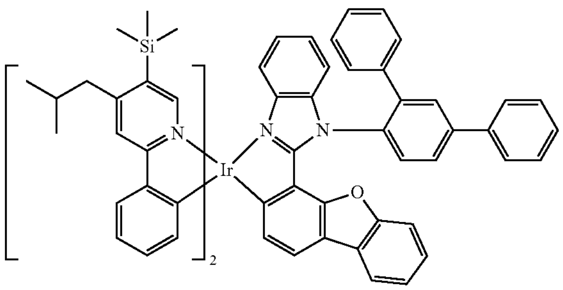
95
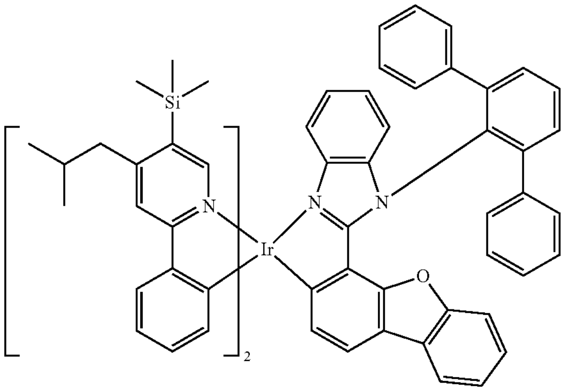
96
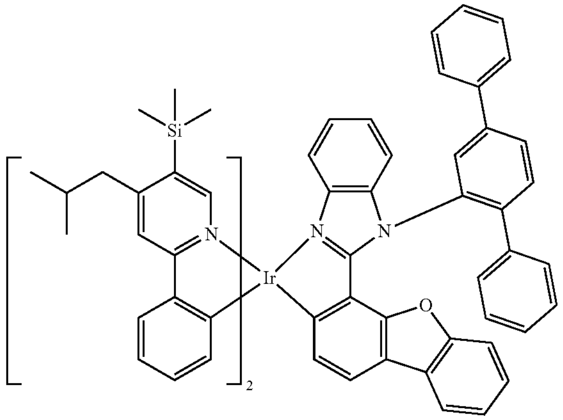
97
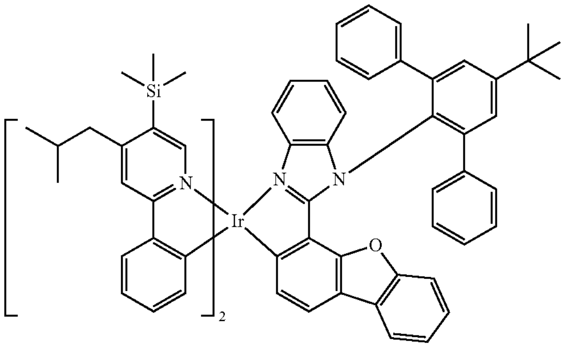
-continued
98
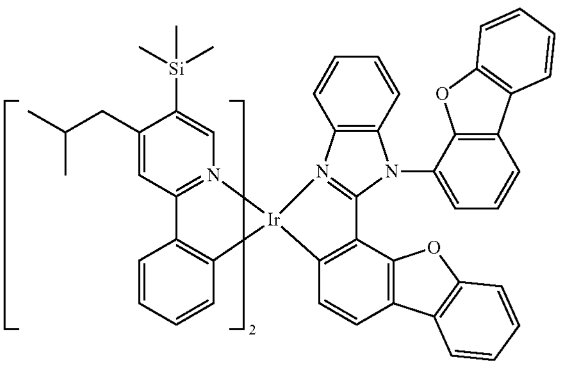
99
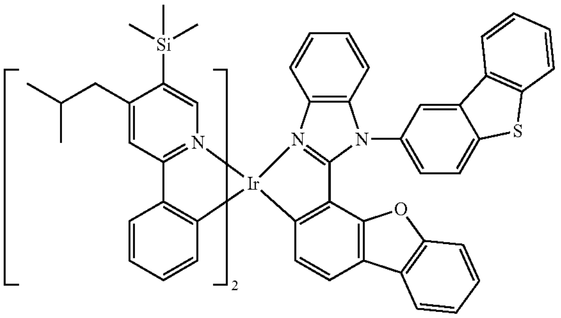
100
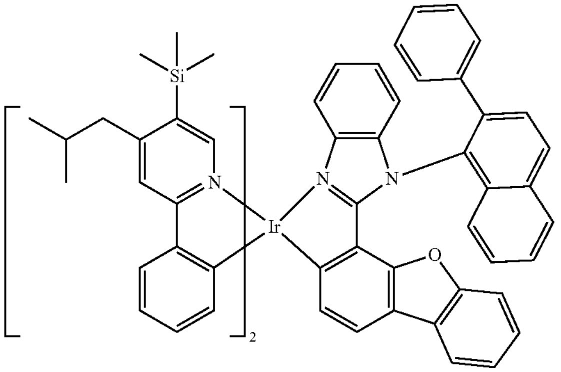
101
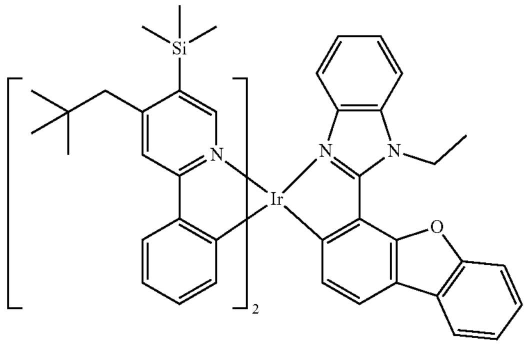

-continued
102
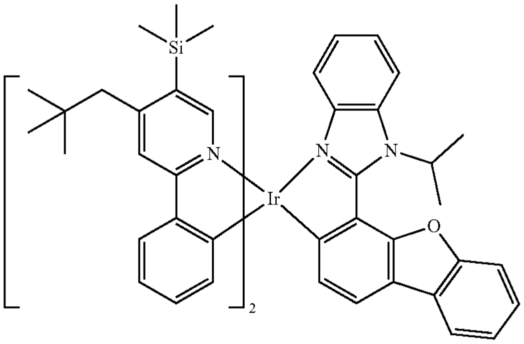
103
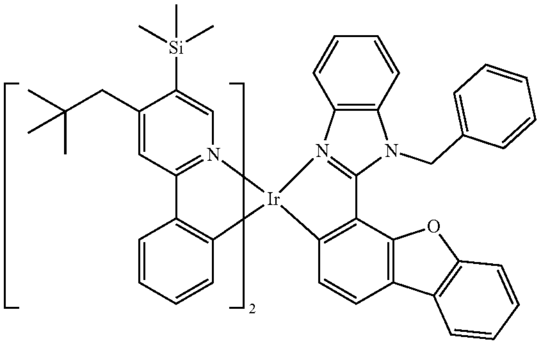
104
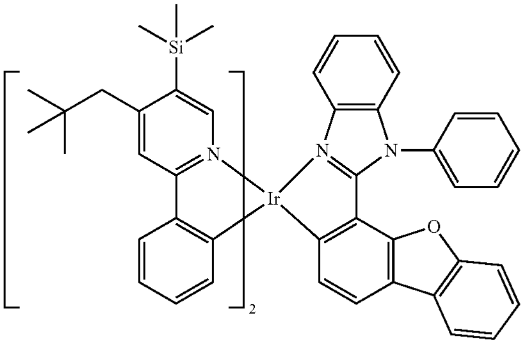
105
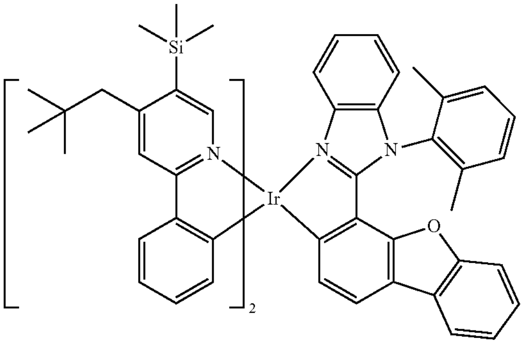
-continued
106
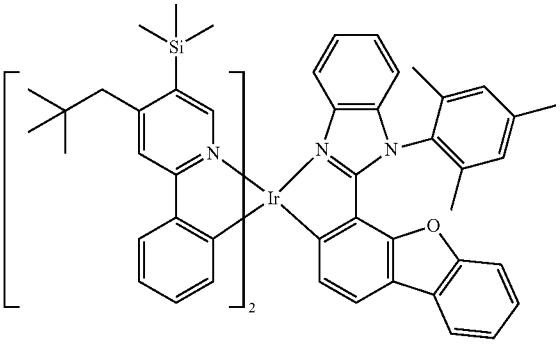
107
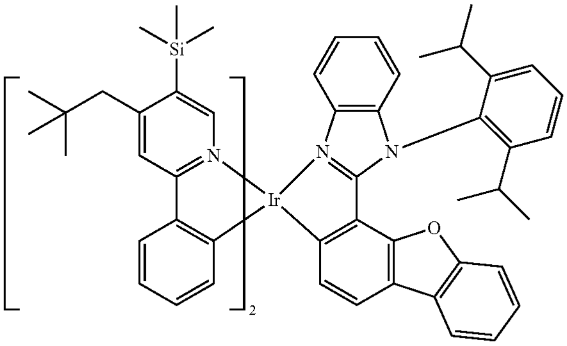
108
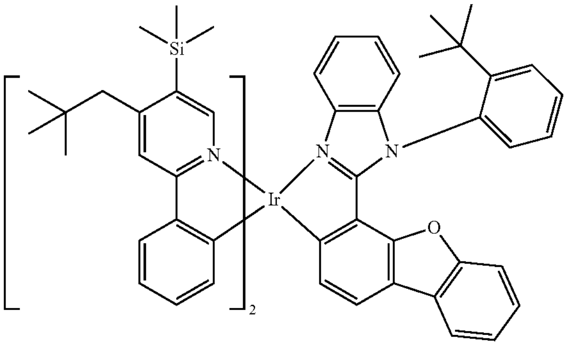
109
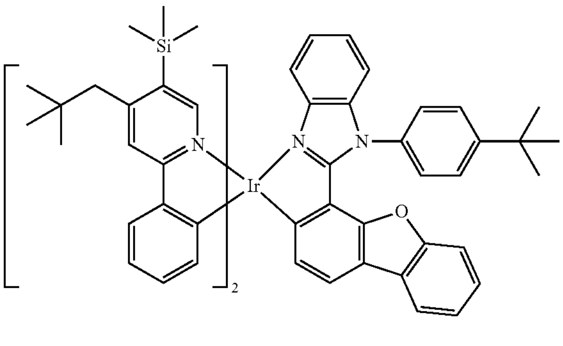

-continued
110
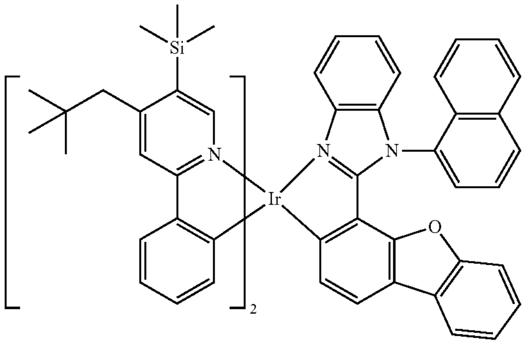
111
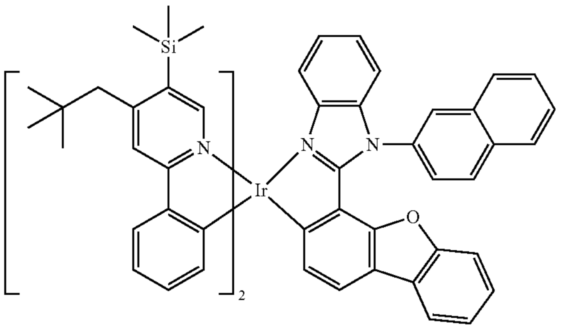
112
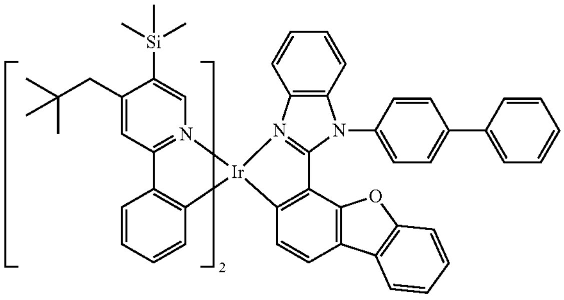
113
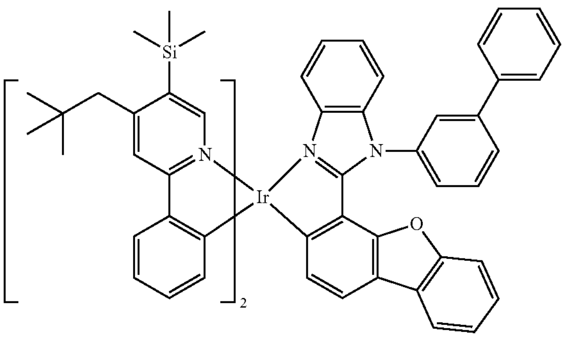
-continued
114
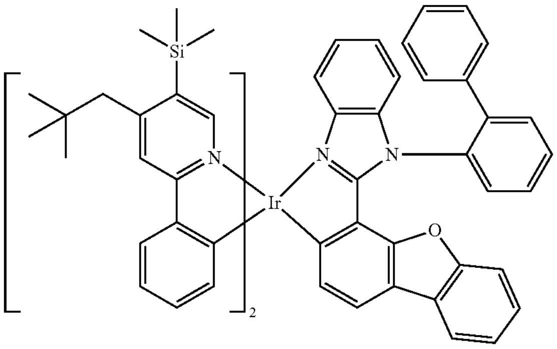
115
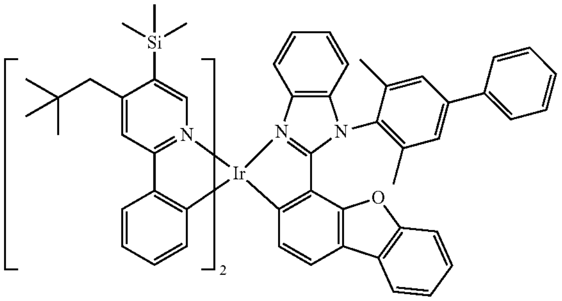
116
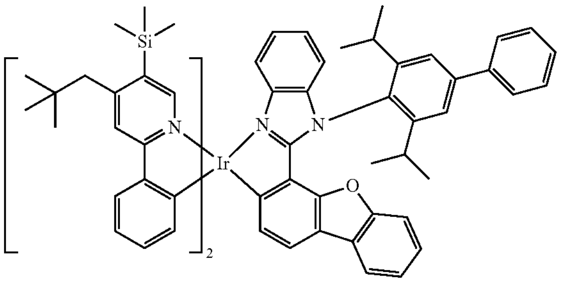
117
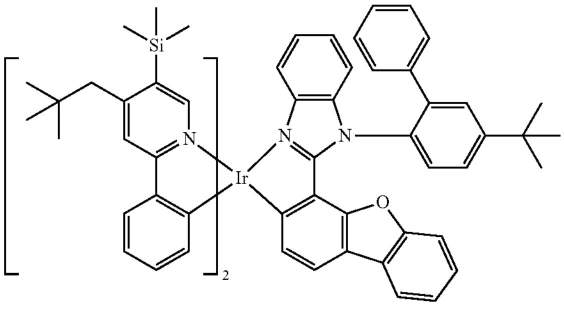

-continued
118
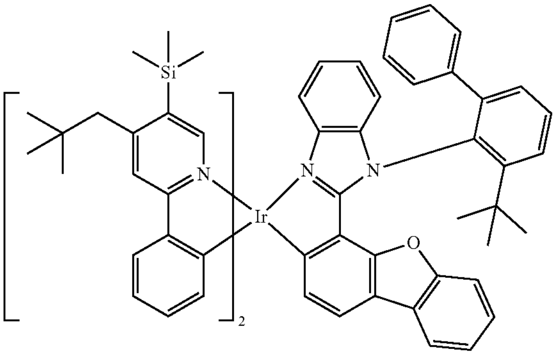
119
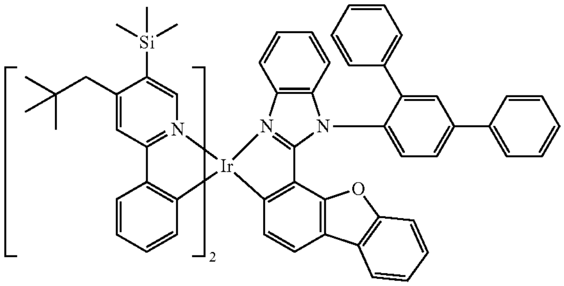
120
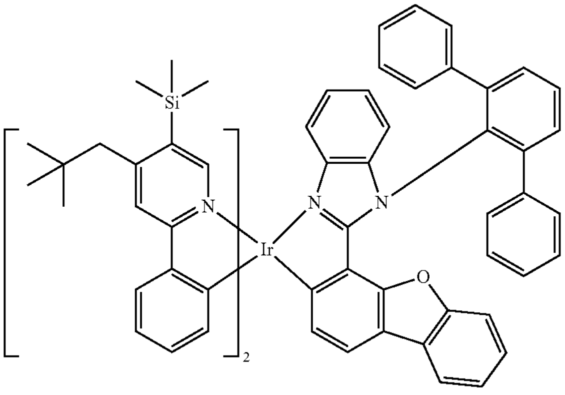
121
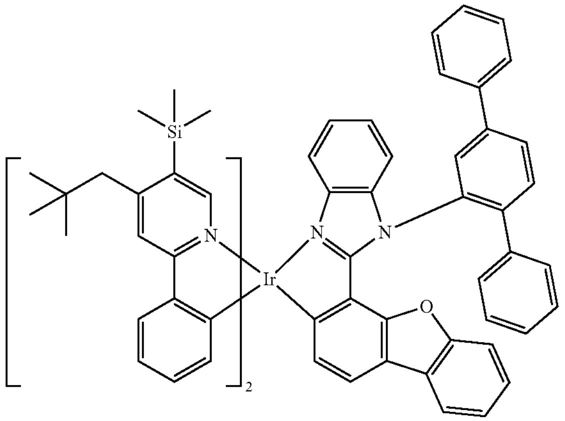
-continued
122
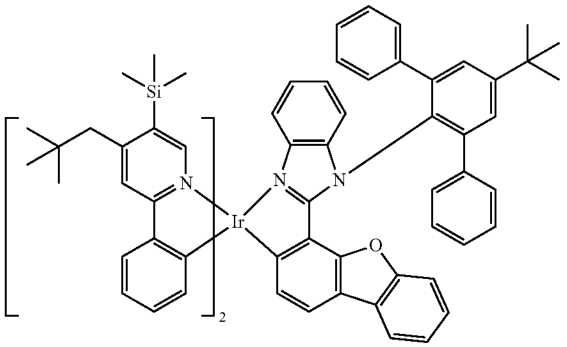
123
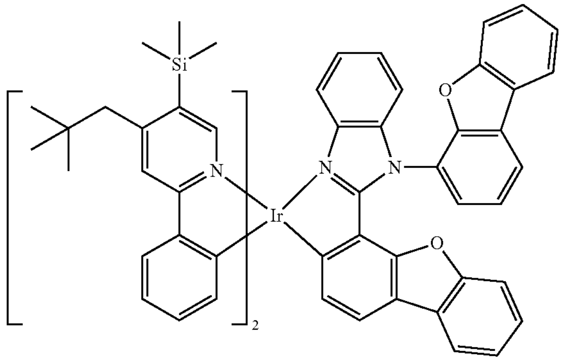
124
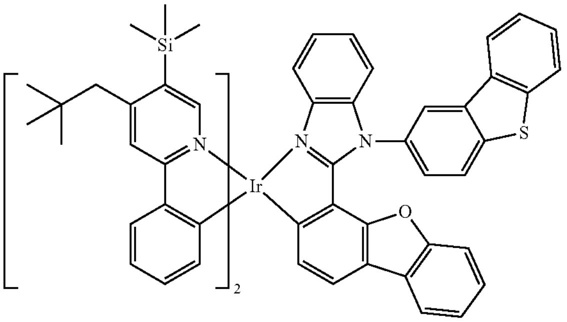
125
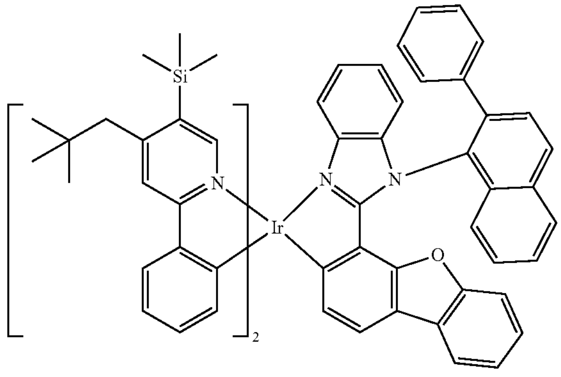

-continued
126
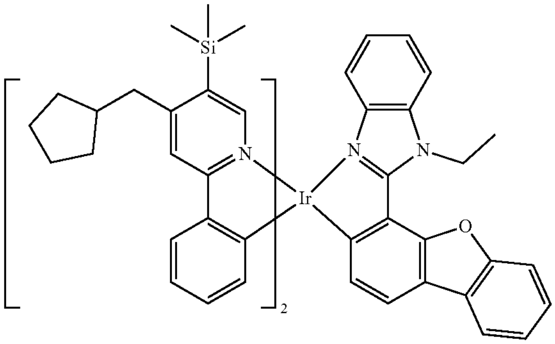
127
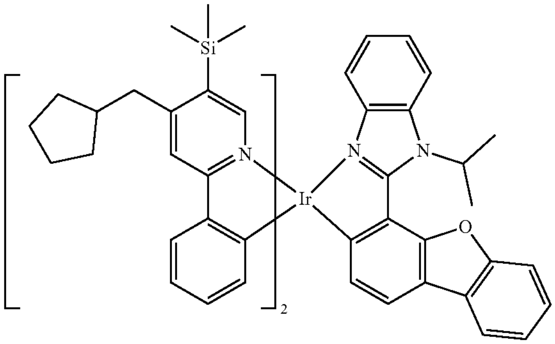
128
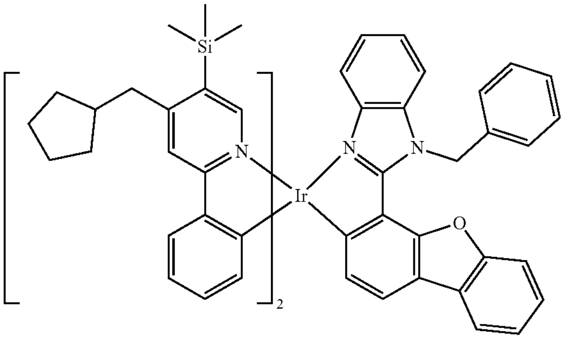
129
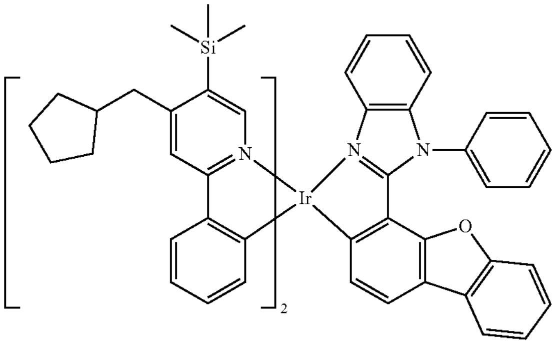
-continued
130
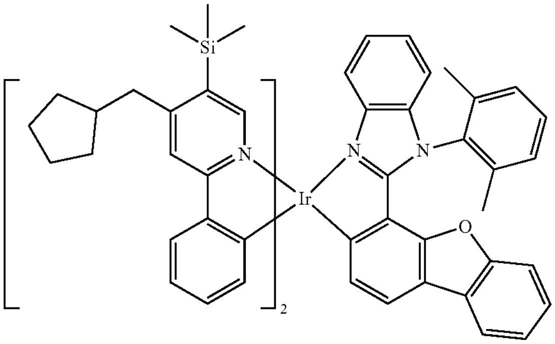
131
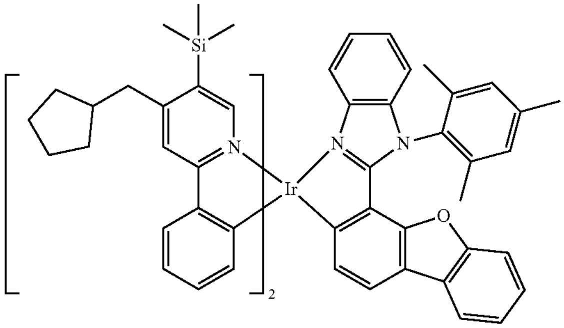
132
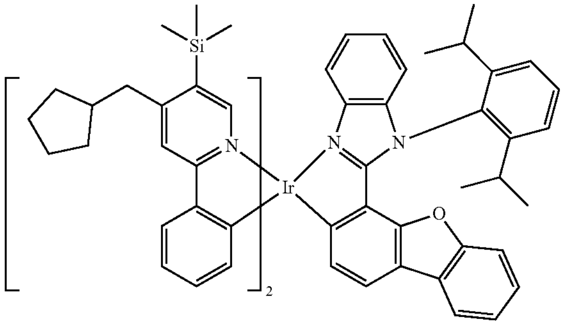
133
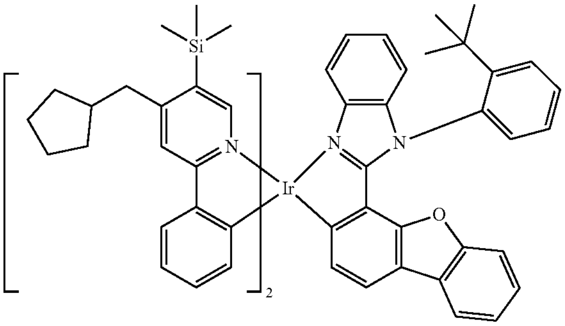

-continued
134
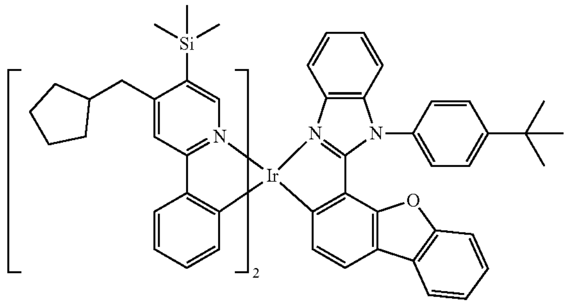
135
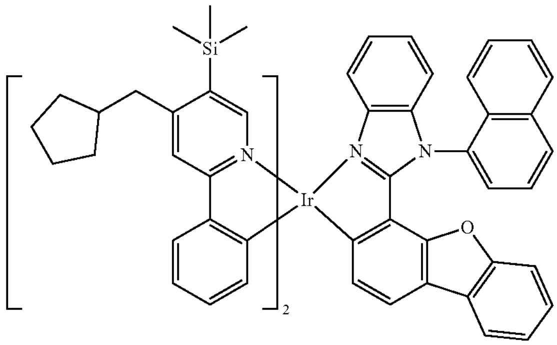
136
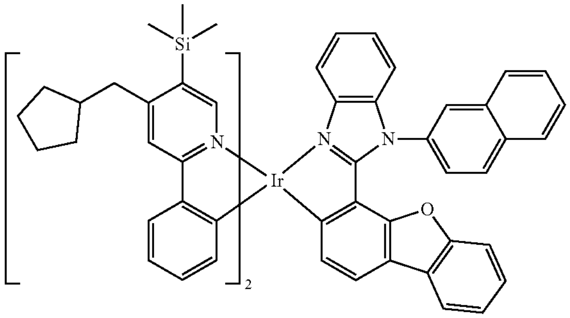
137
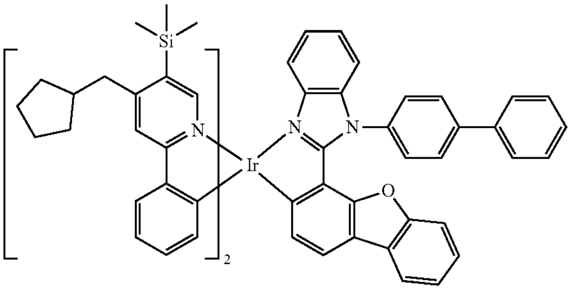
-continued
138
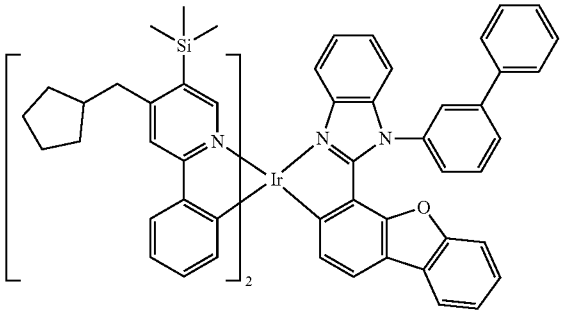
139
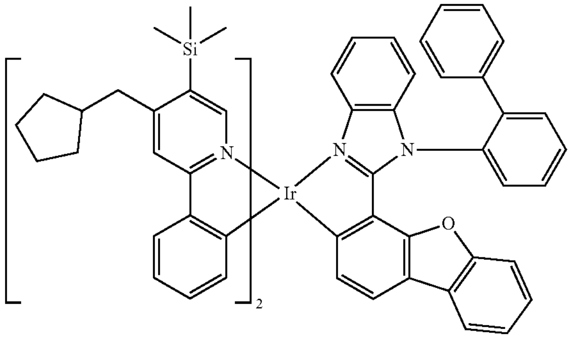
140
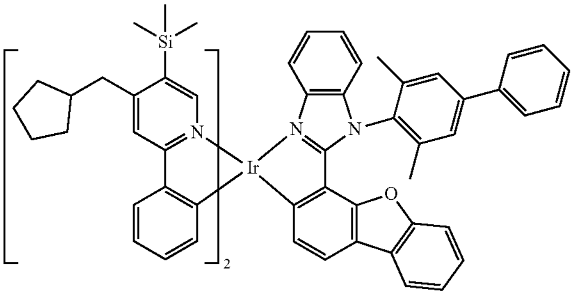
141
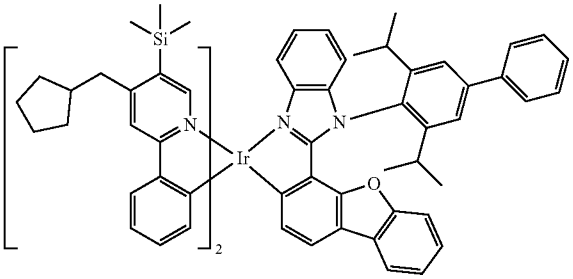
142
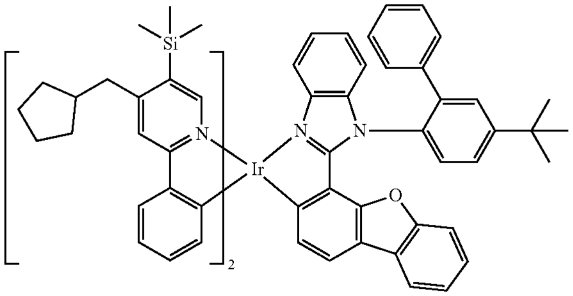

-continued
143
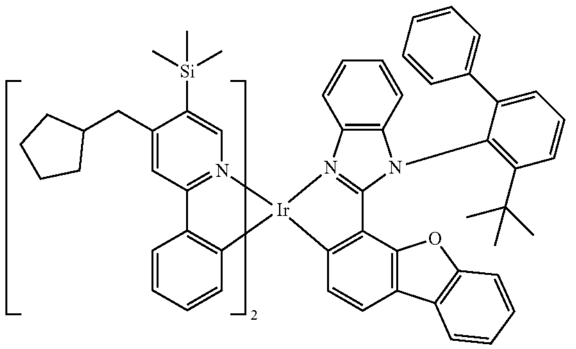
144
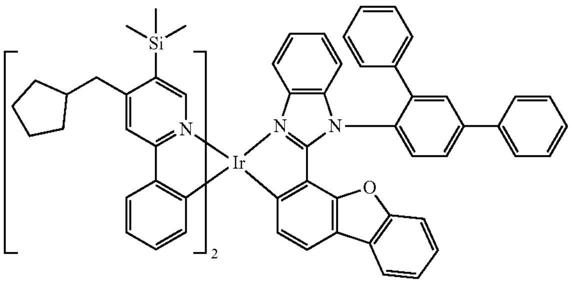
145
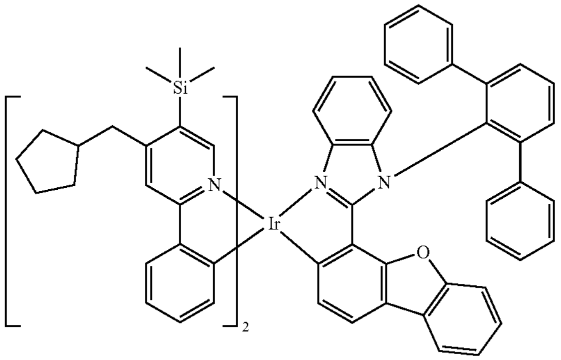
146
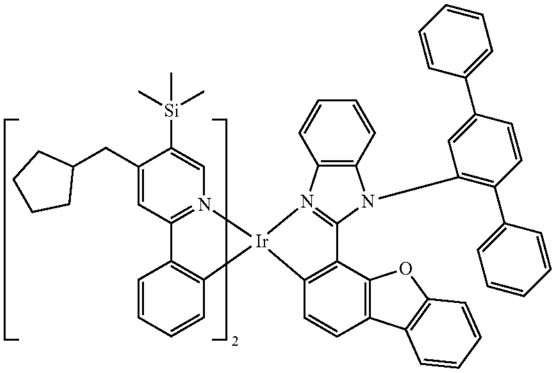
-continued
147
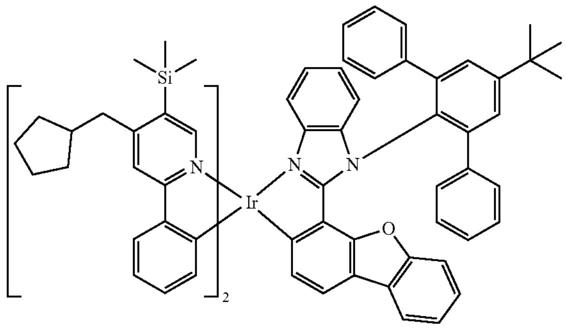
148
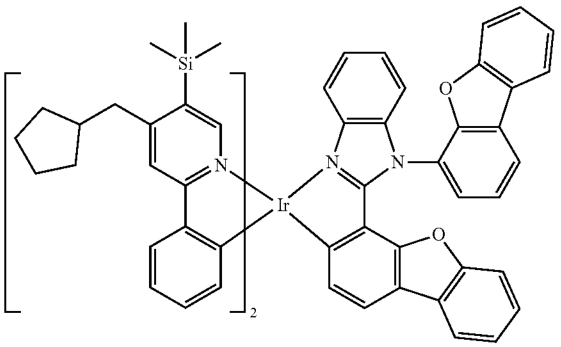
149
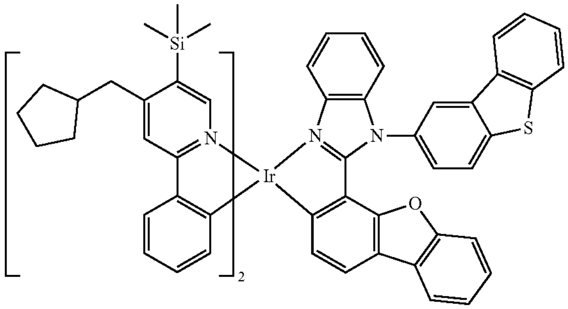
150
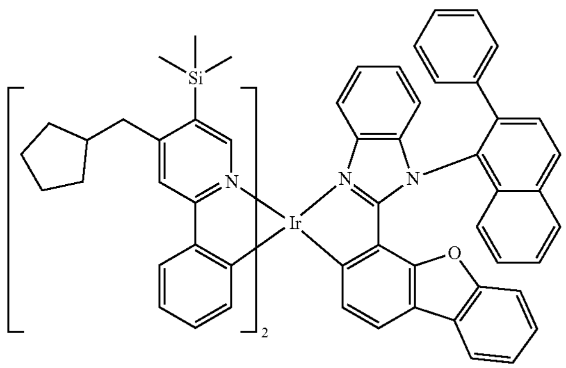

-continued
151
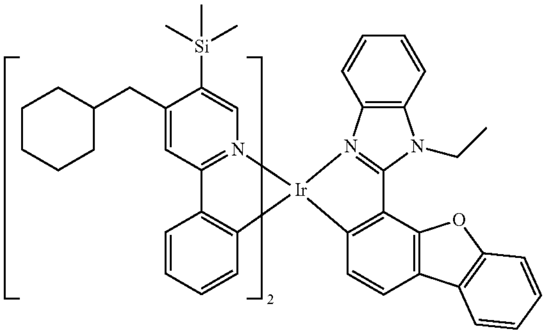
152
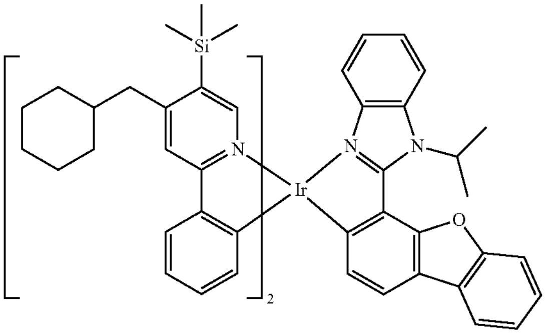
153
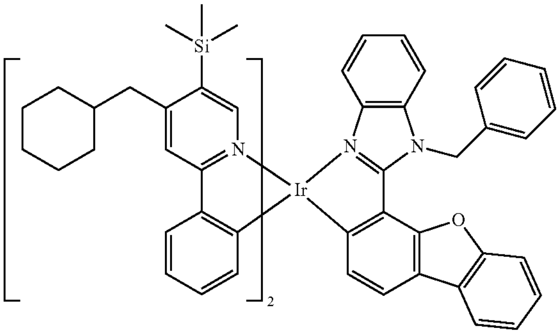
154
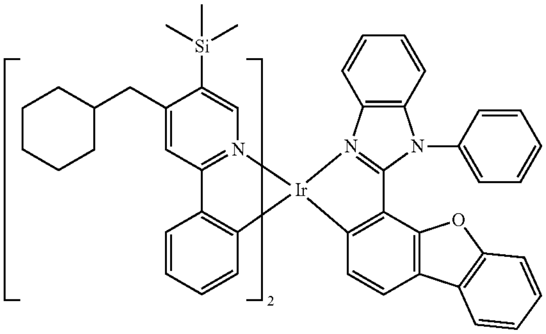
-continued
155
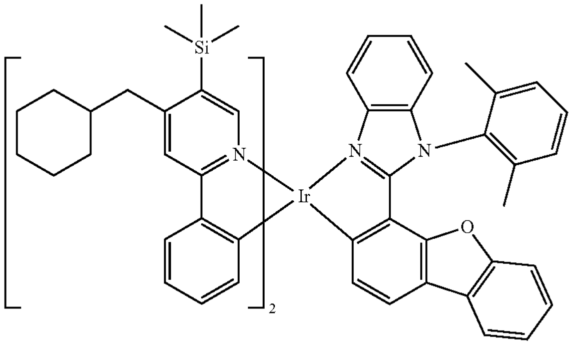
156
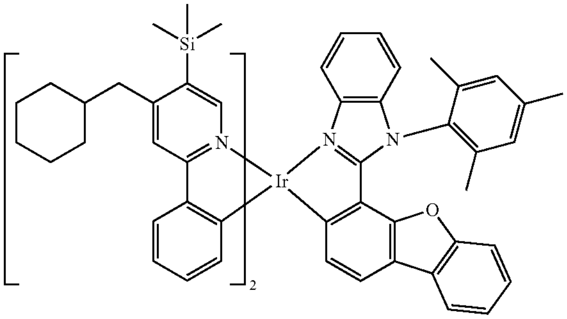
157
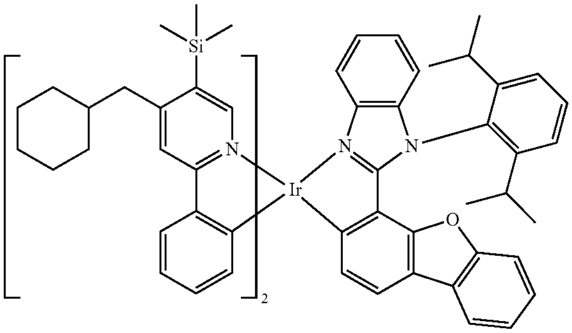
158
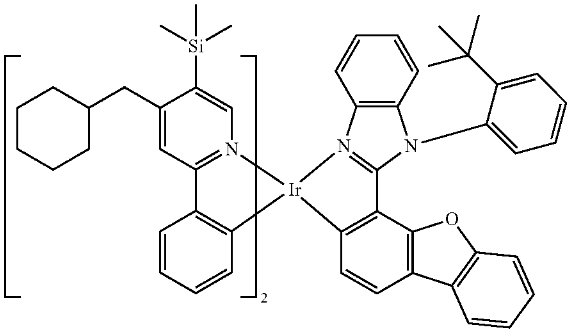

-continued
159
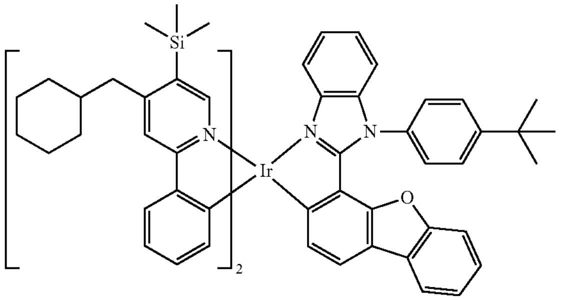
160
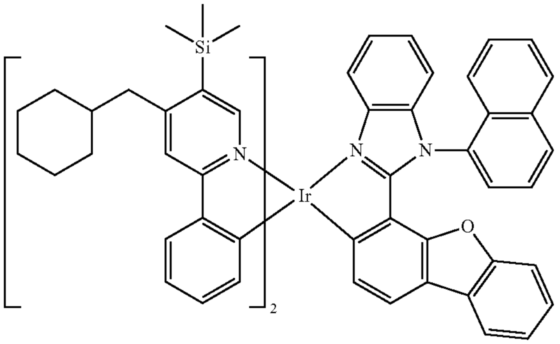
161
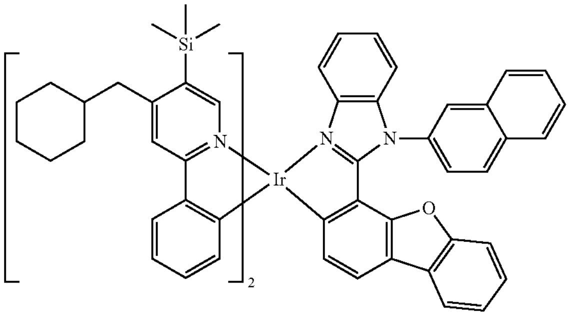
162
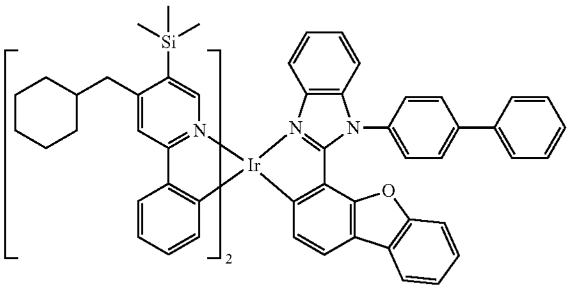
-continued
163
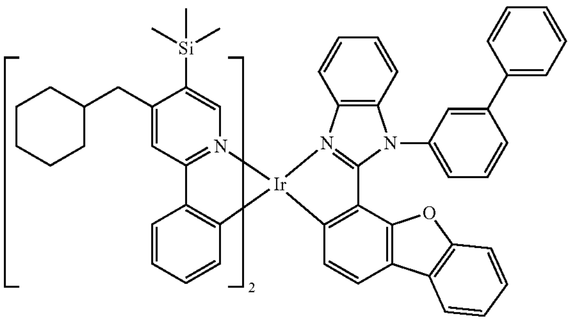
164
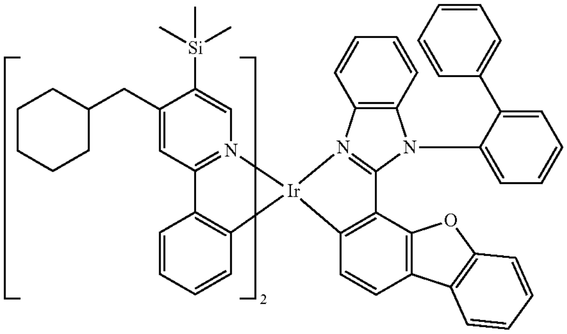
165
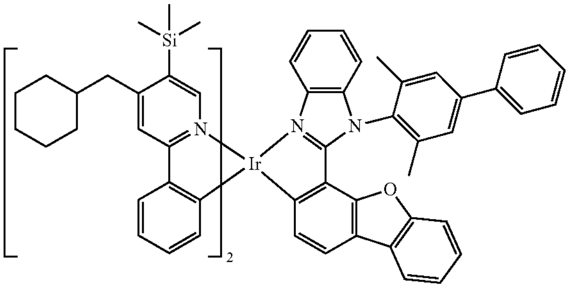
166
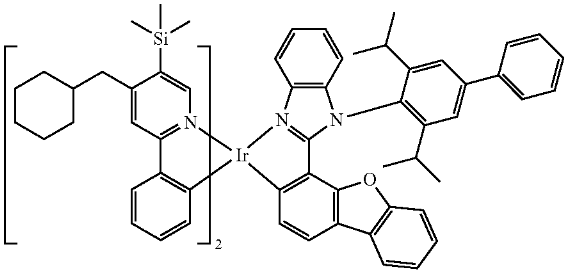
167
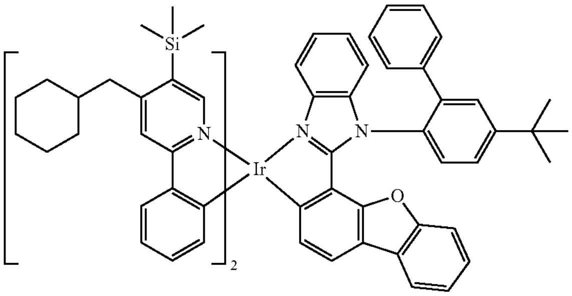

168
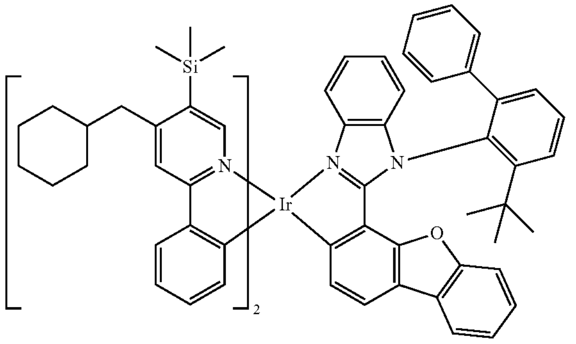
169
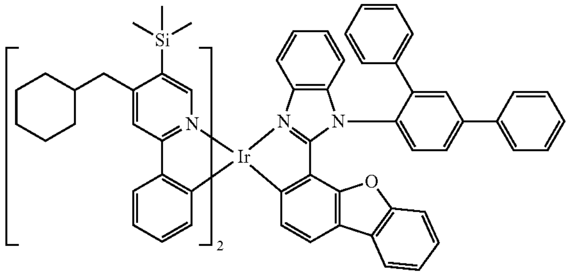
170
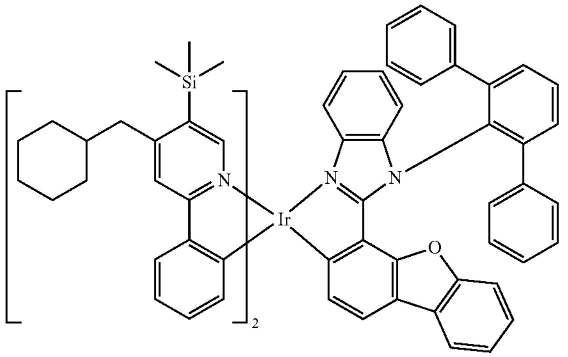
171
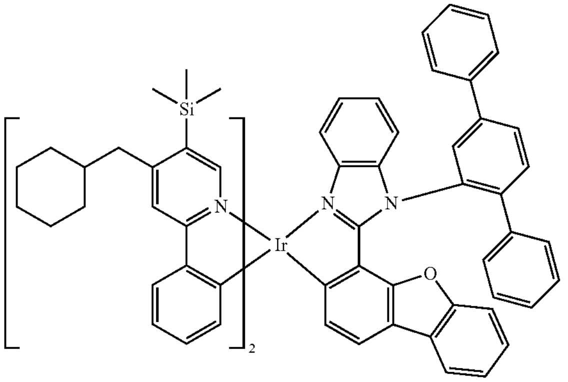
172
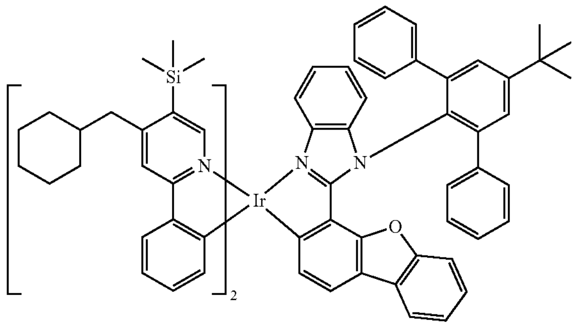
173
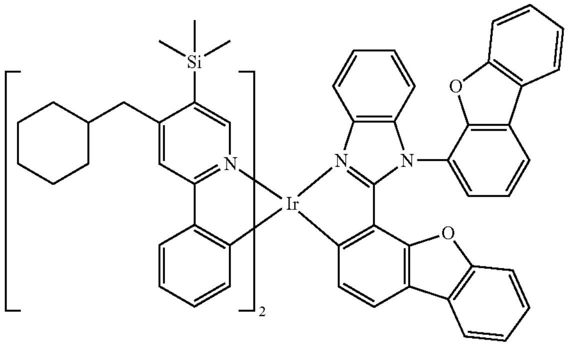
174
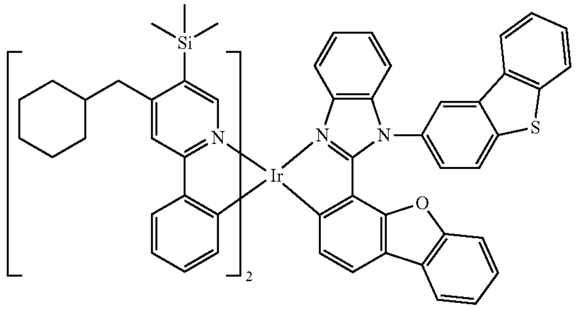
175
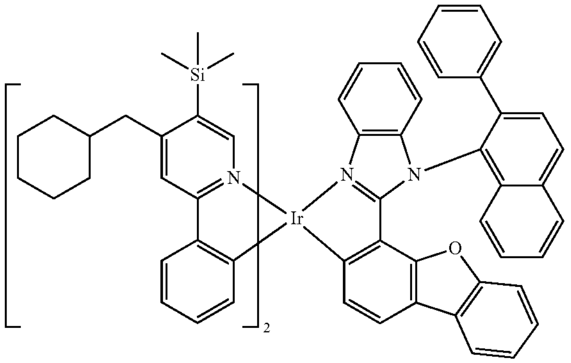

176
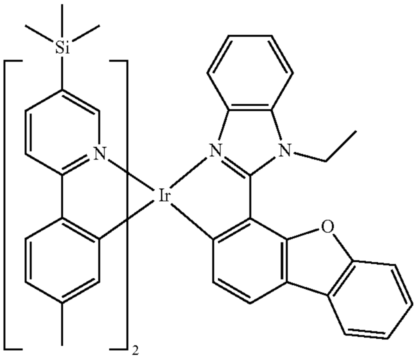
177
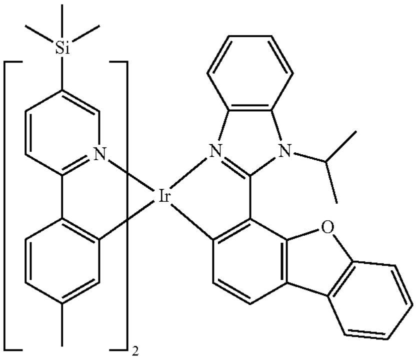
178
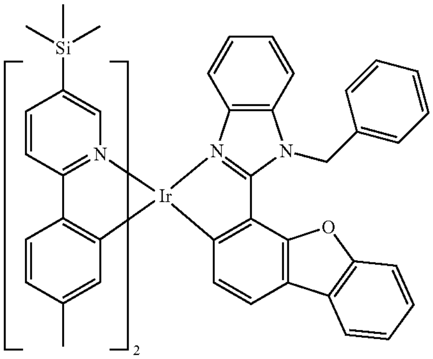
179
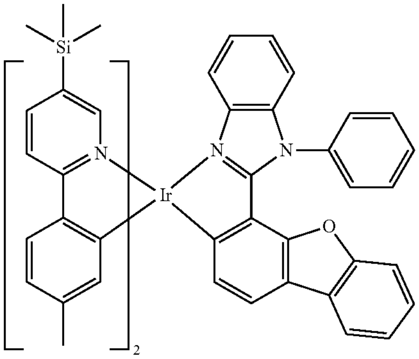
180
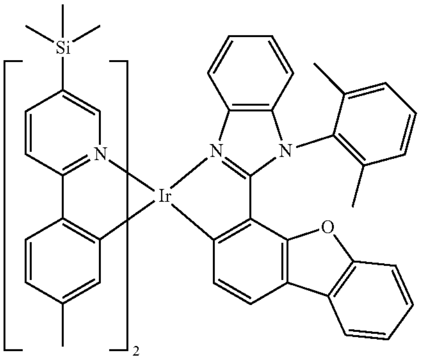
181
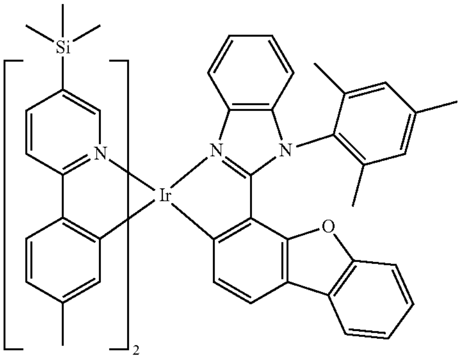
182
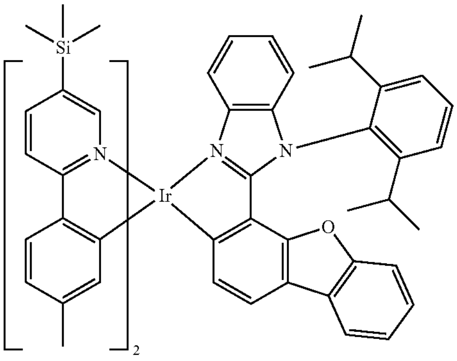
183
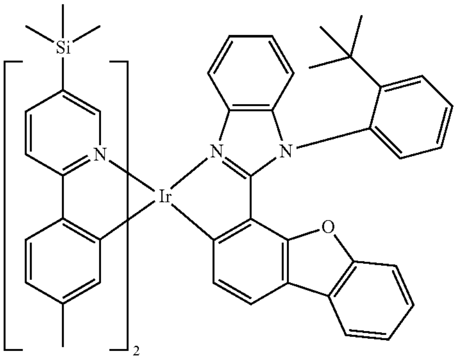

-continued
184
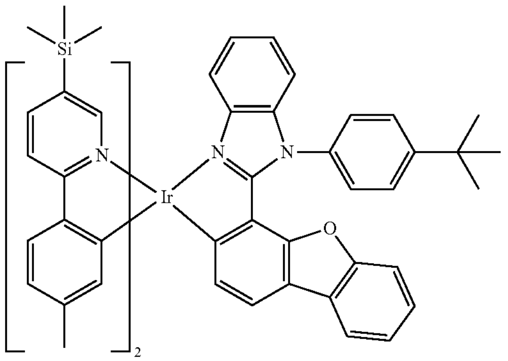
185
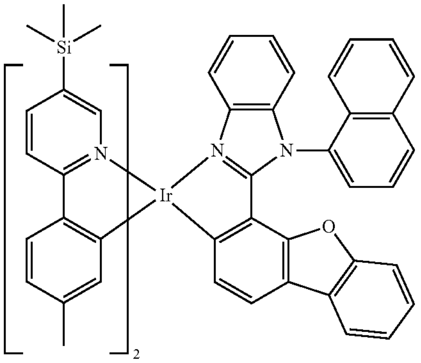
186
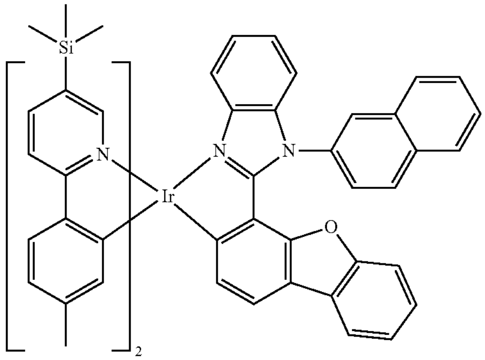
187
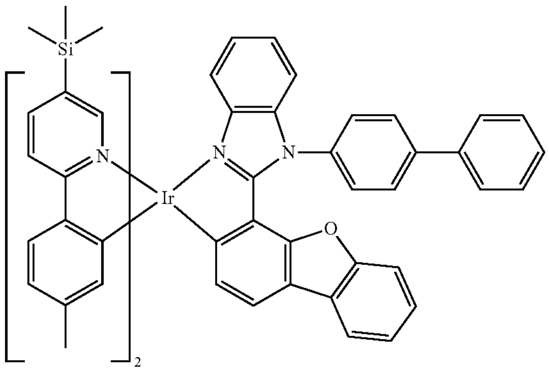
-continued
188
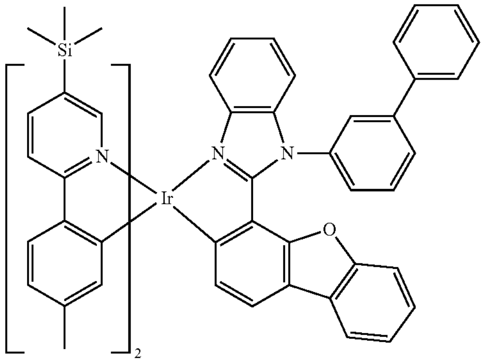
189
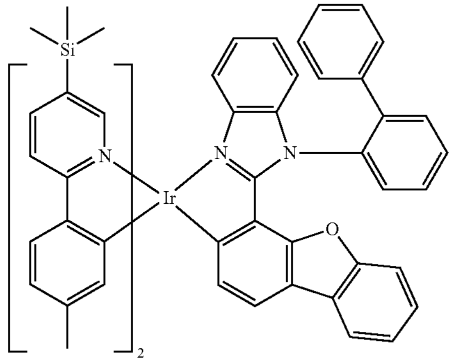
190
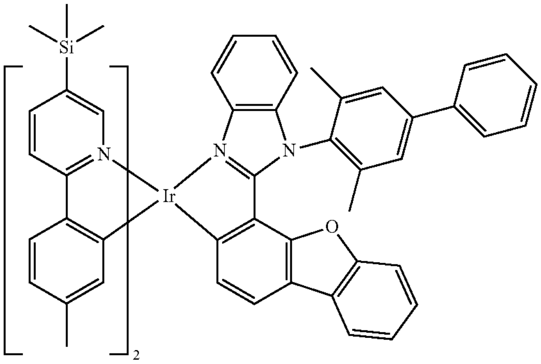
191
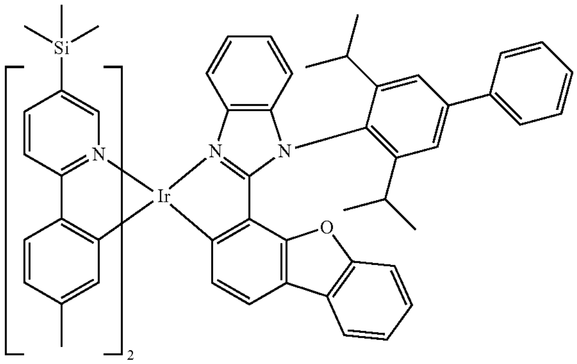

-continued
192
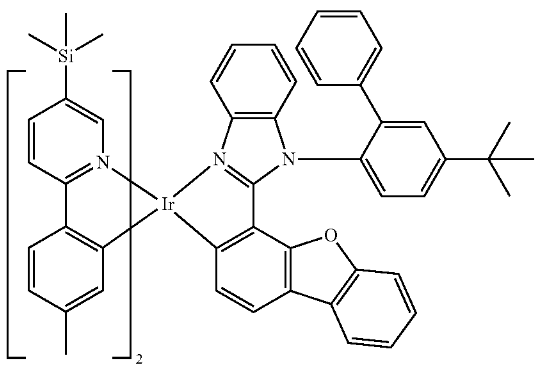
193
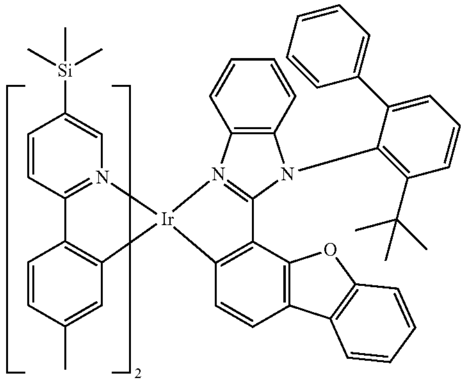
194
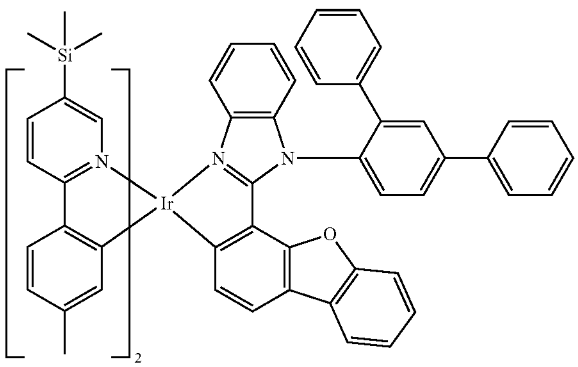
195
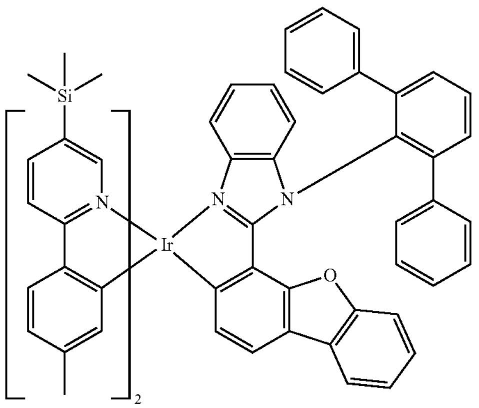
-continued
196
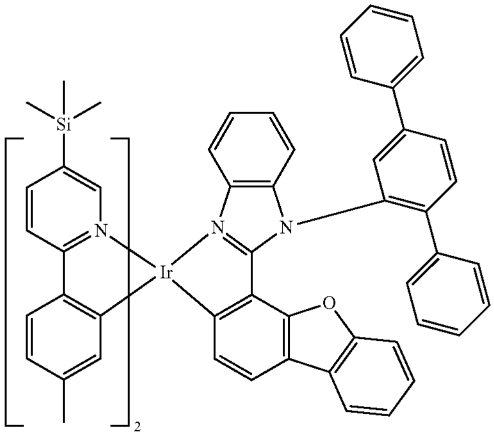
197
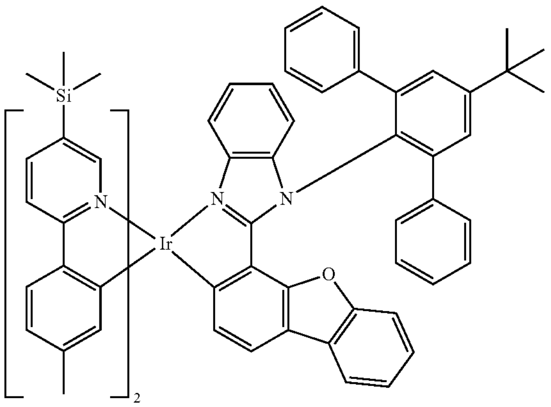
198
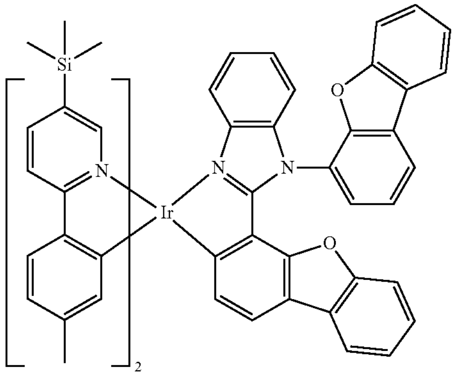

-continued
199
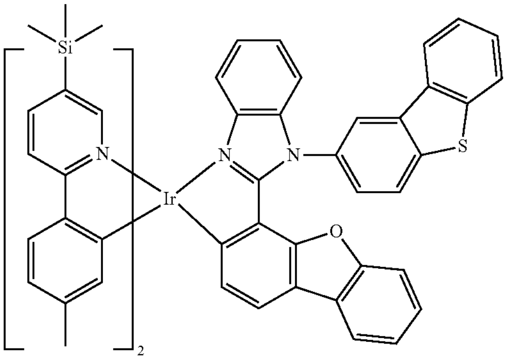
200
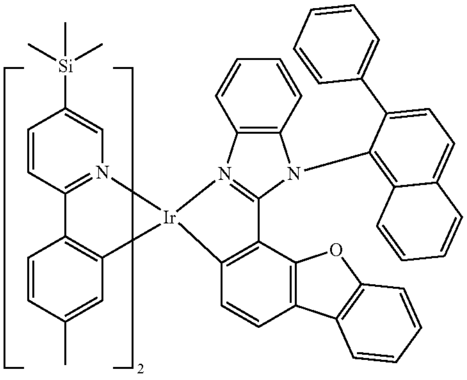
201
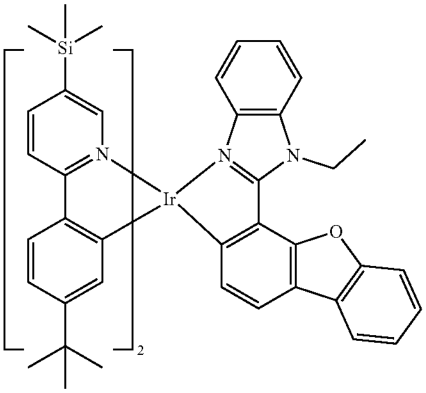
202
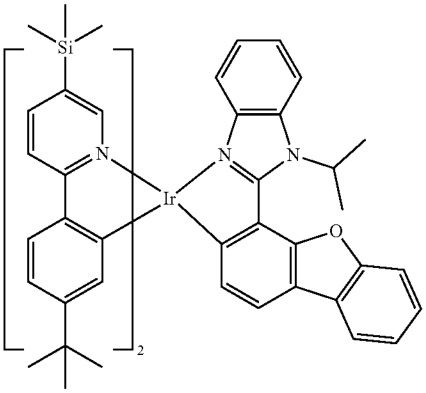
203
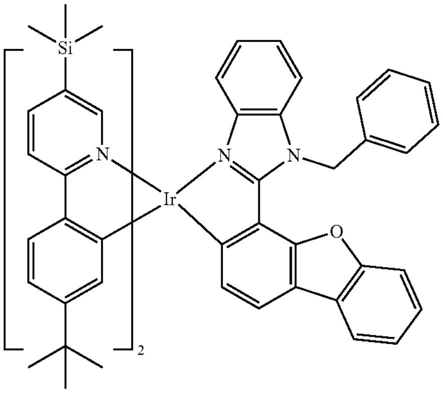
204
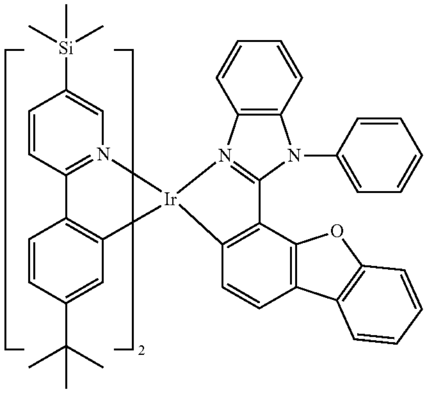
205
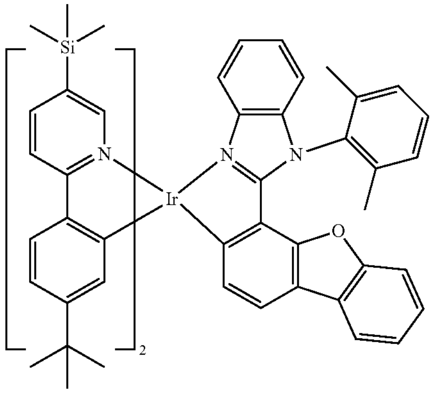
206
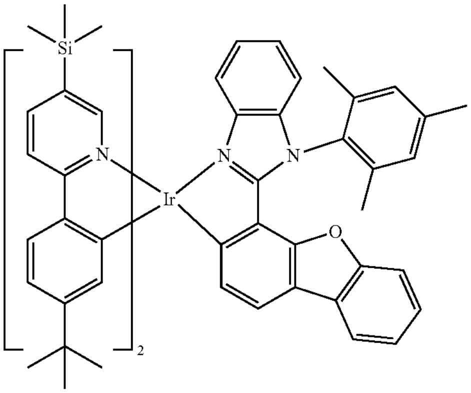

-continued
207
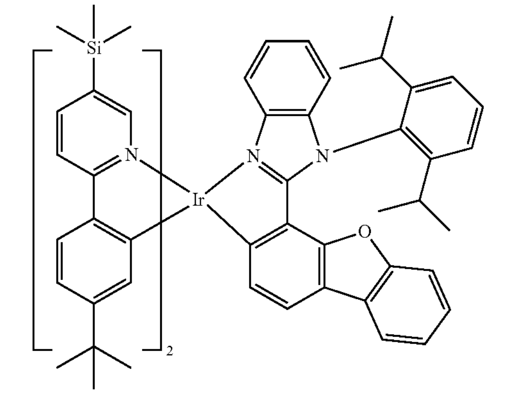
208
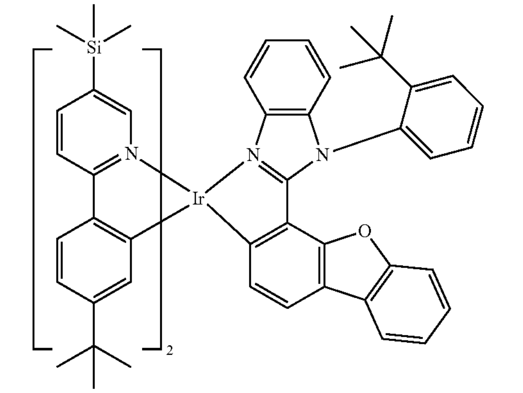
209
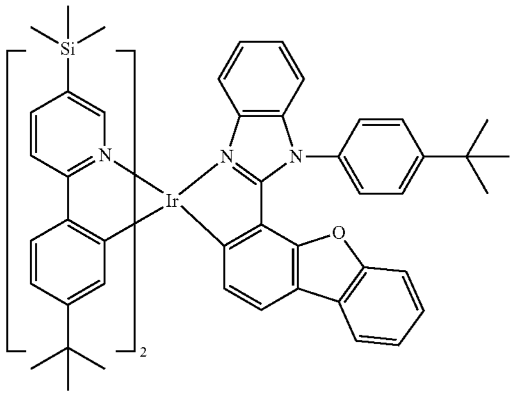
210
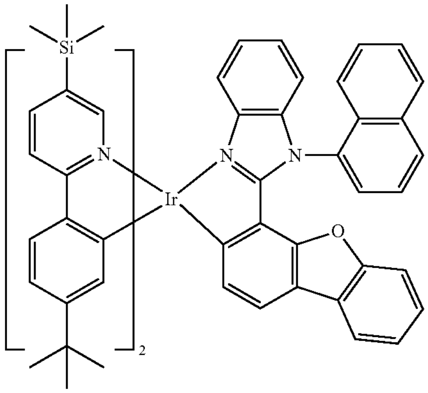
-continued
211
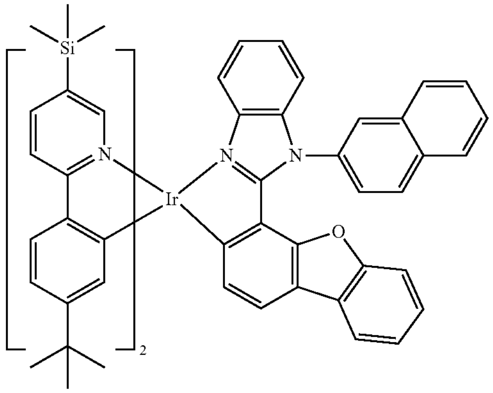
212
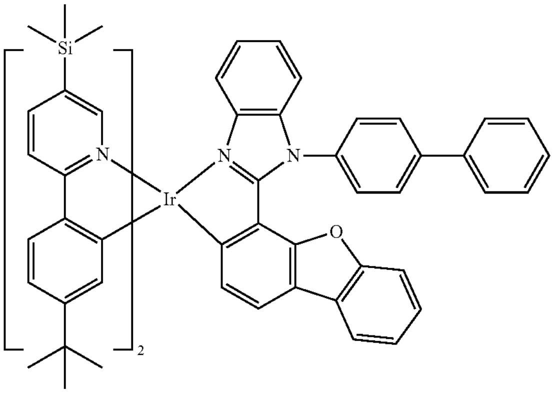
213
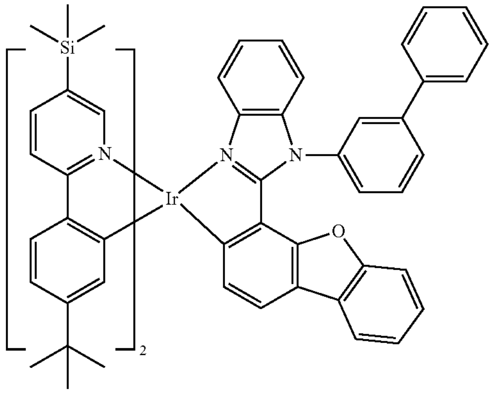
214
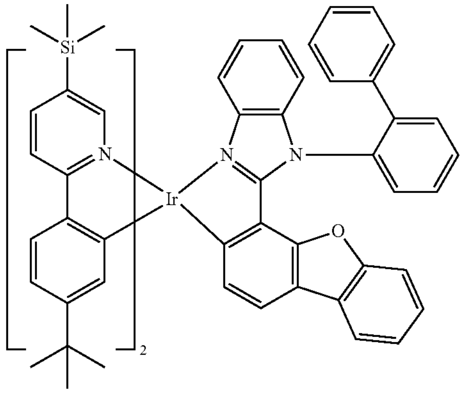

-continued
215
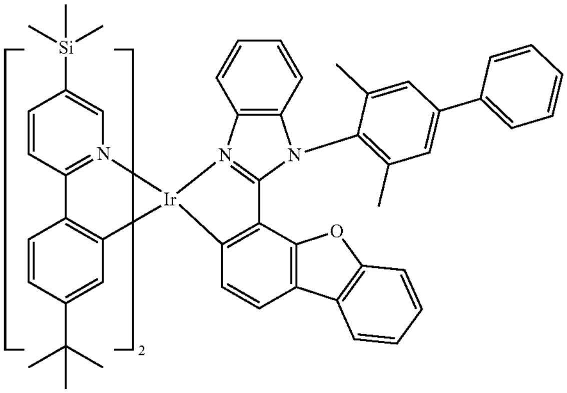
216
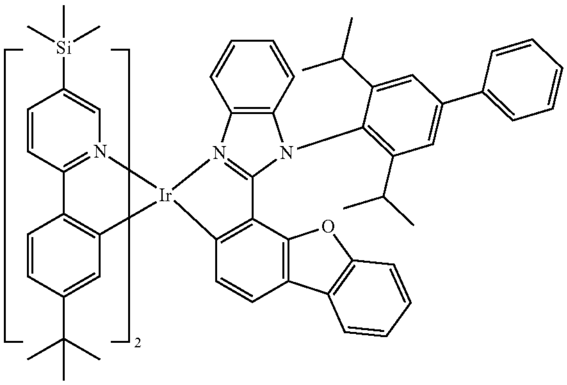
217
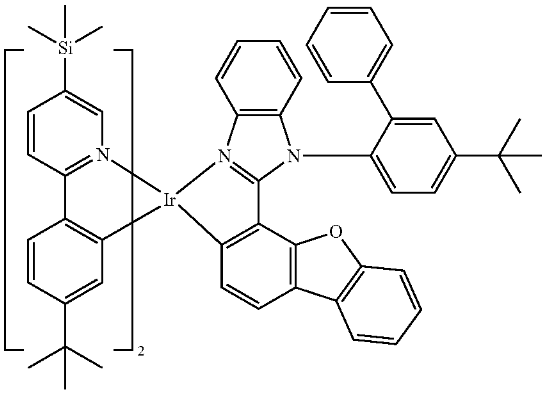
218
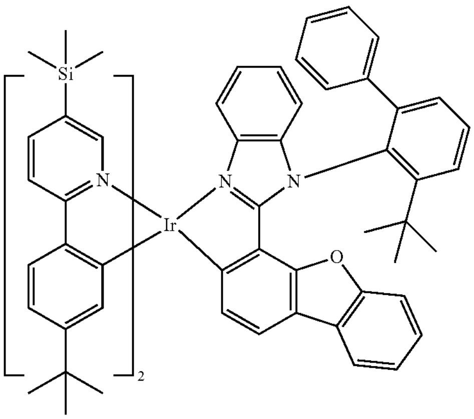
-continued
219
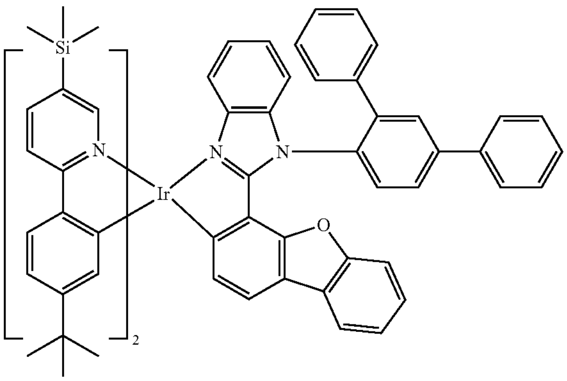
220
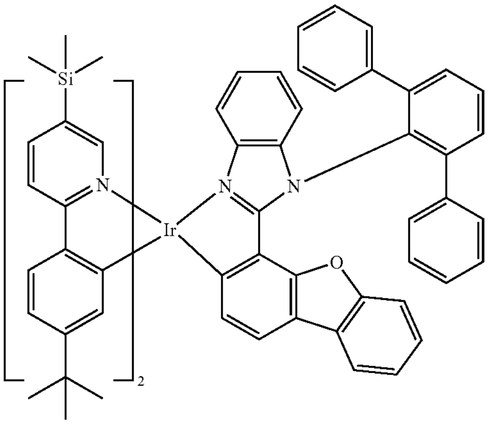
221
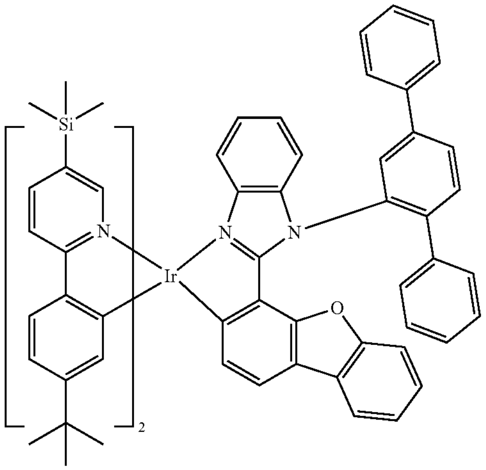

-continued
222
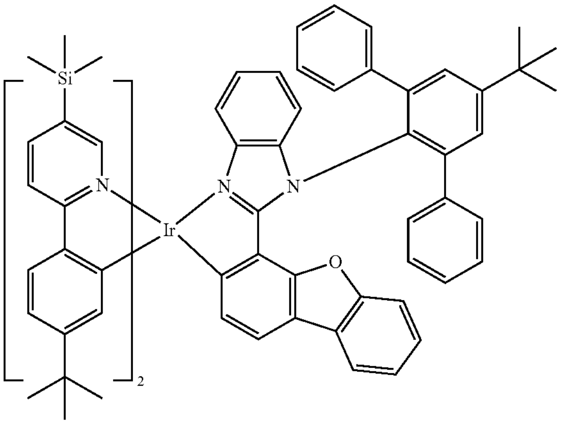
223
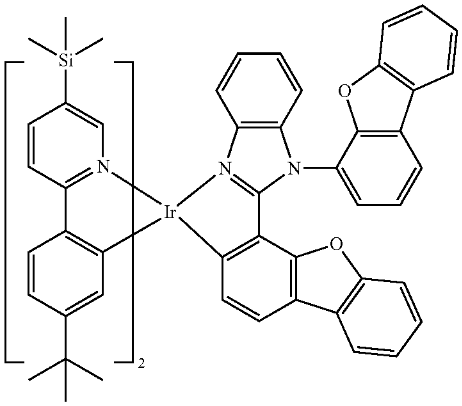
224
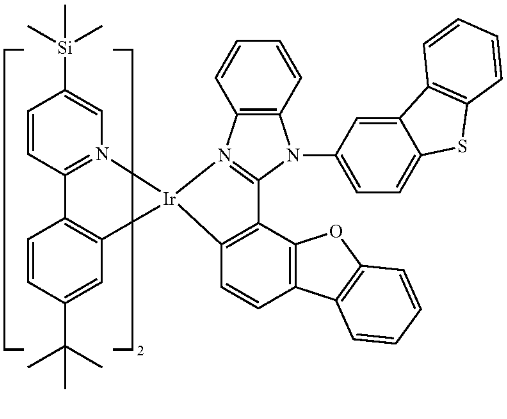
-continued
225
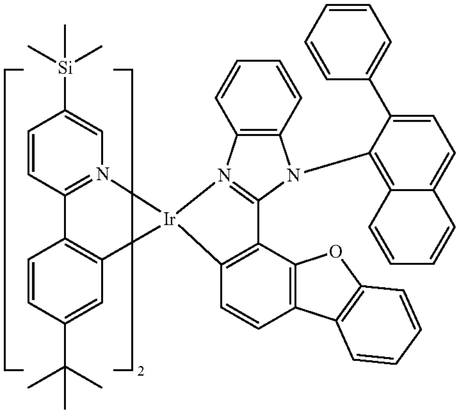
226
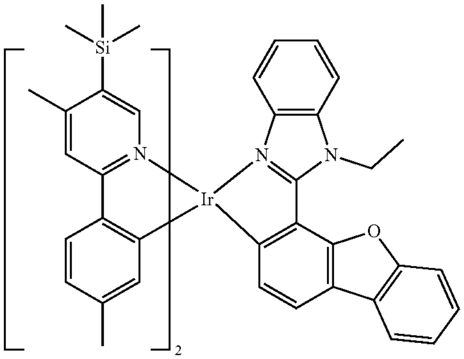
227
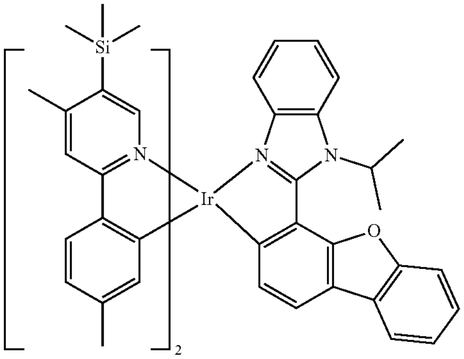
228
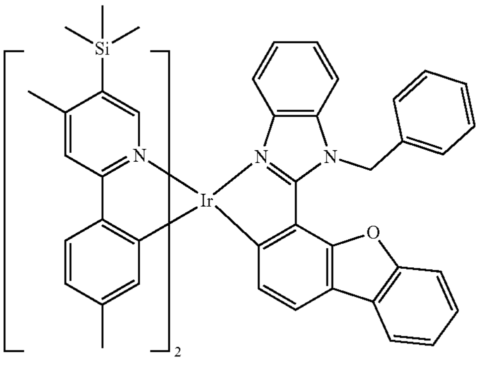

-continued
229
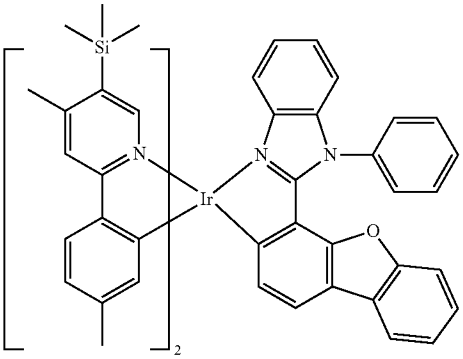
230
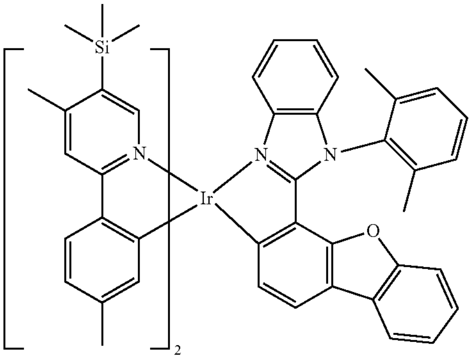
231
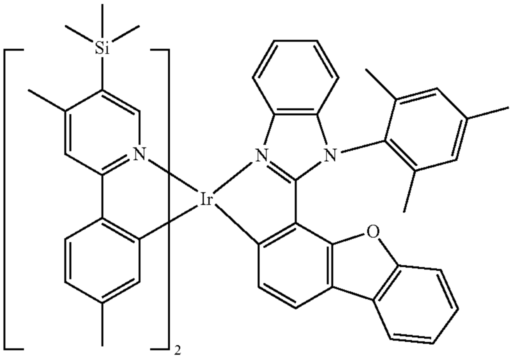
232
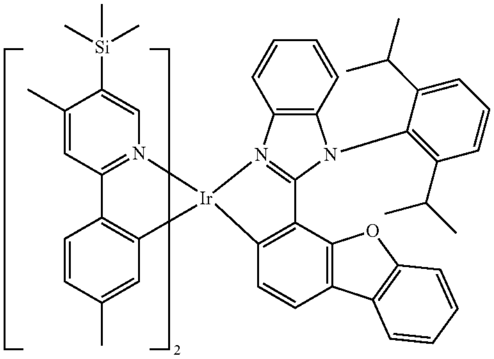
-continued
233
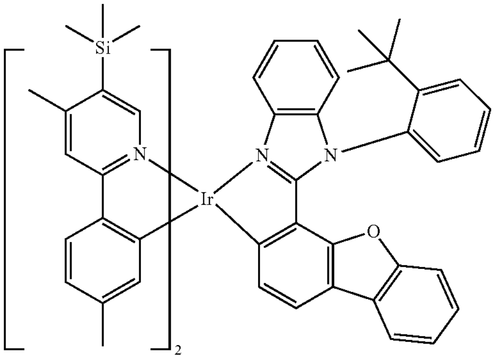
234
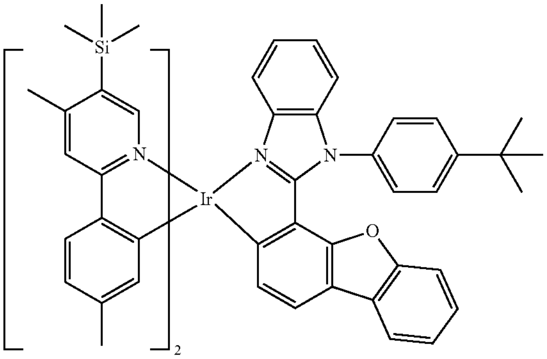
235
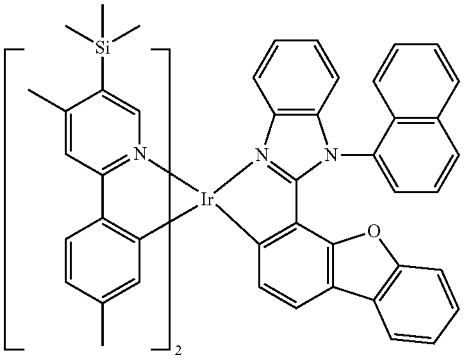
236
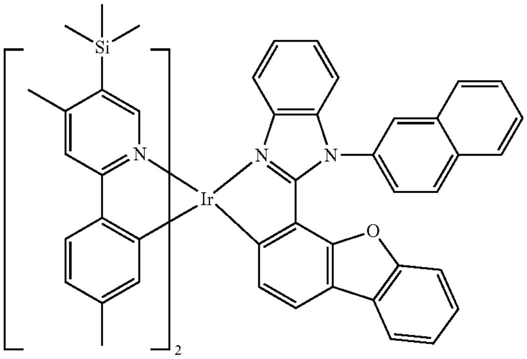

237
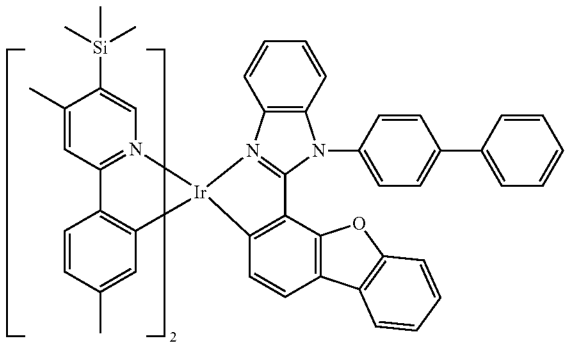
238
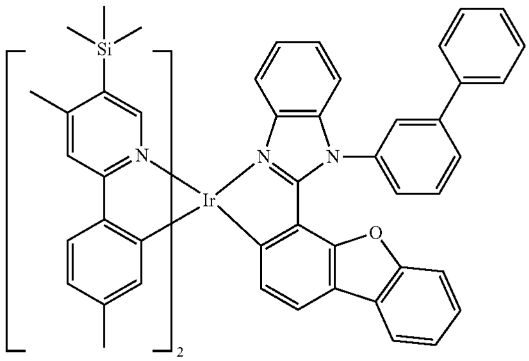
239
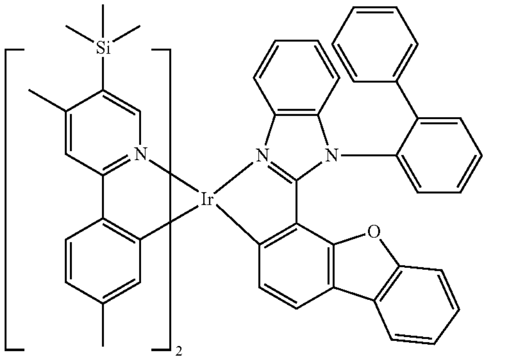
240
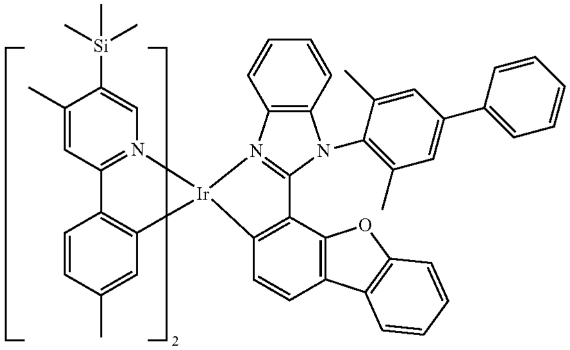
241
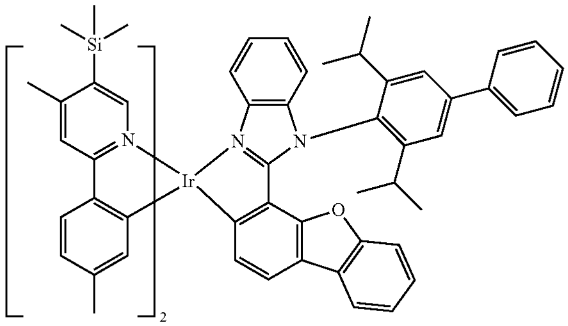
242
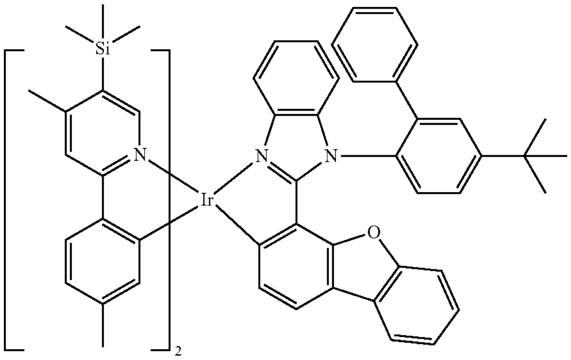
243
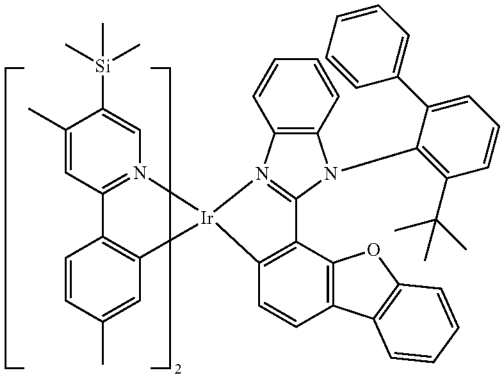
244
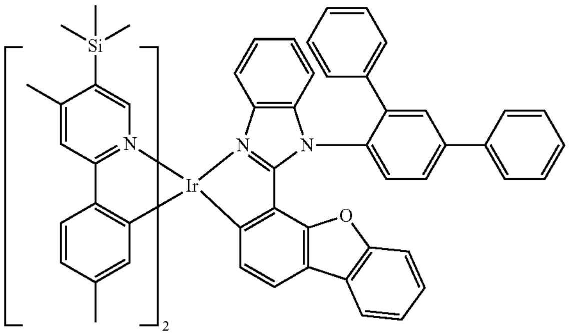

-continued
245
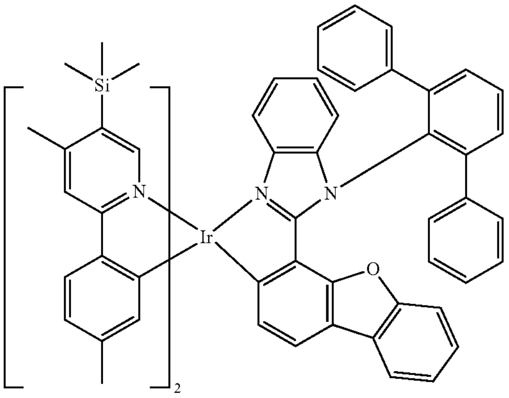
246
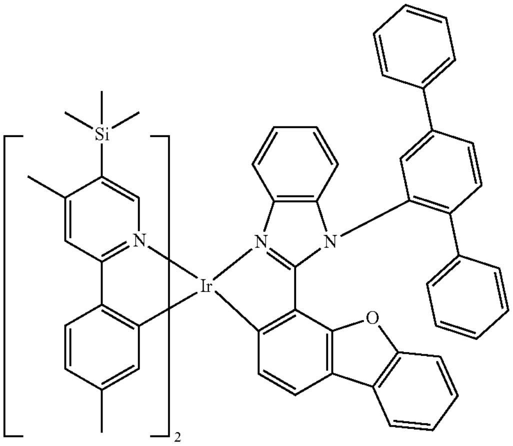
247
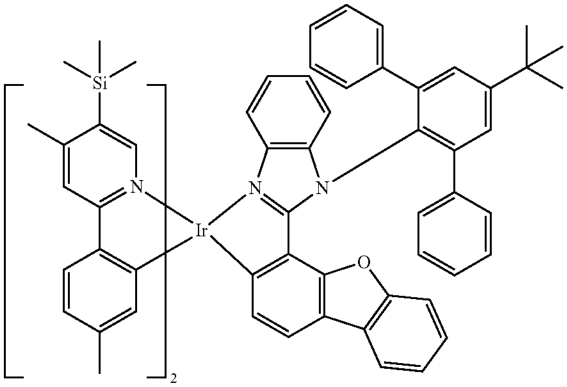
248
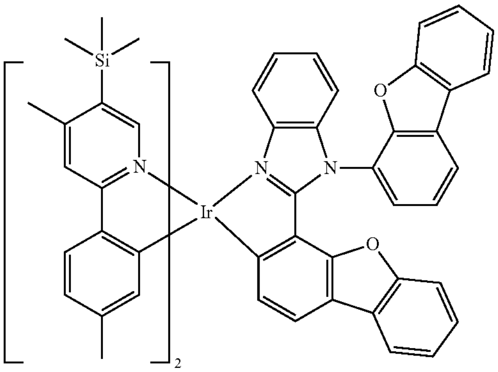
-continued
249
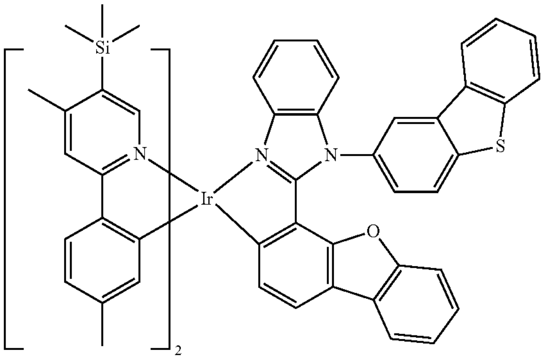
250
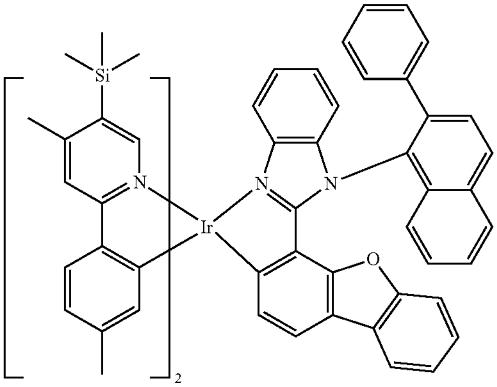
251
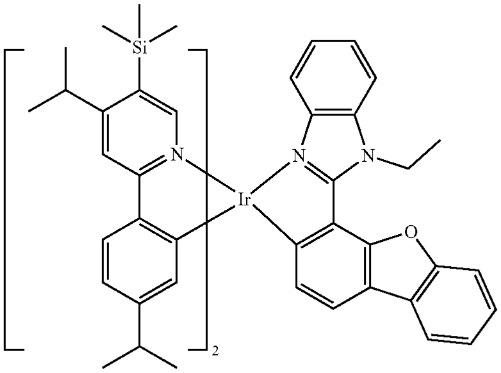
252
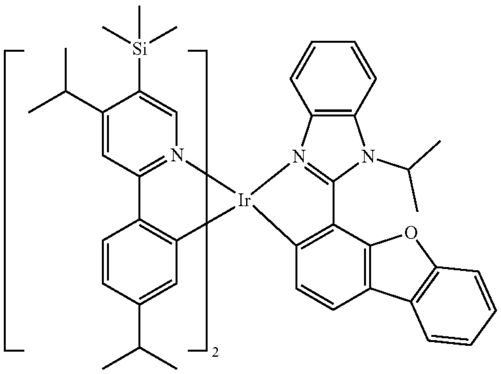

-continued
253
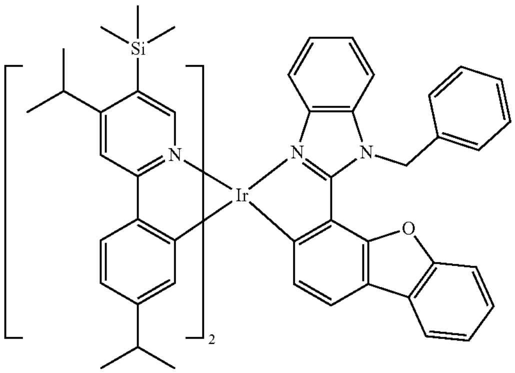
254
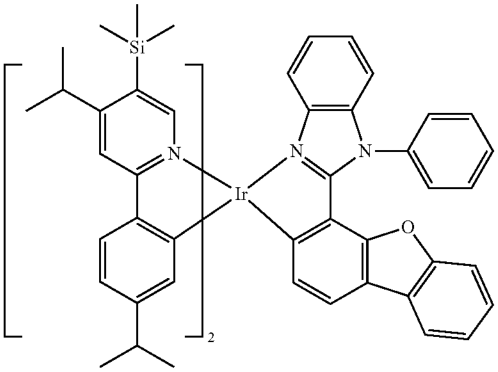
255
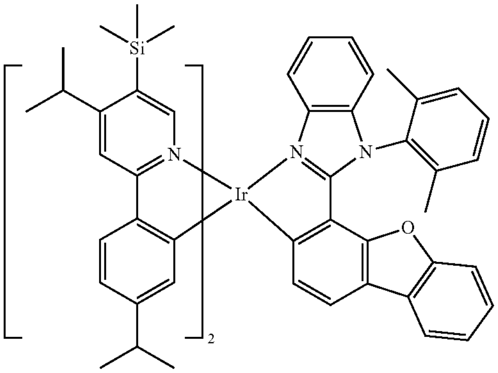
256
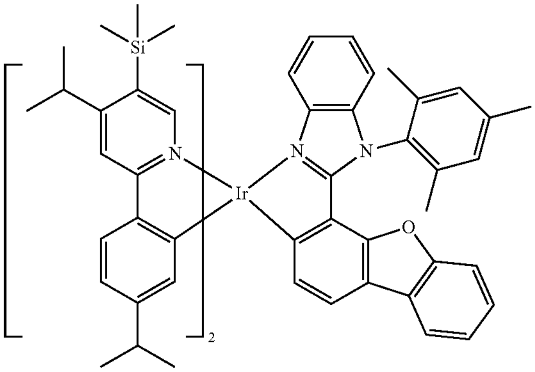
257
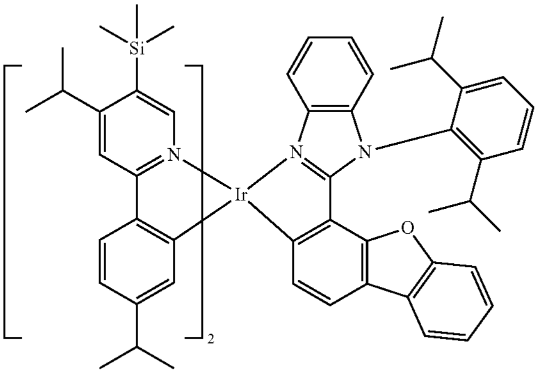
258
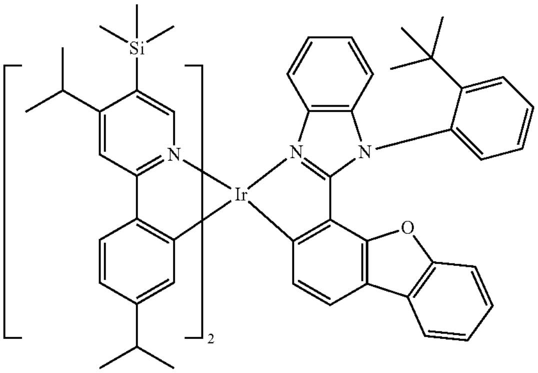
259
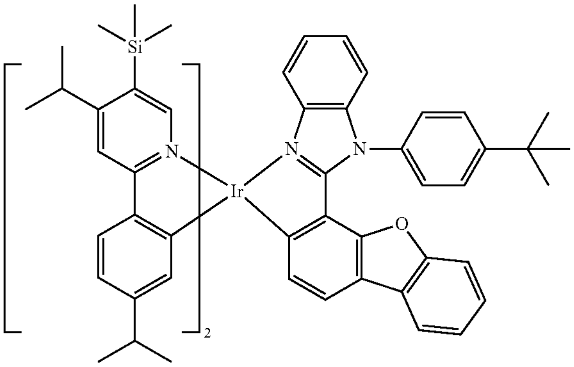
260
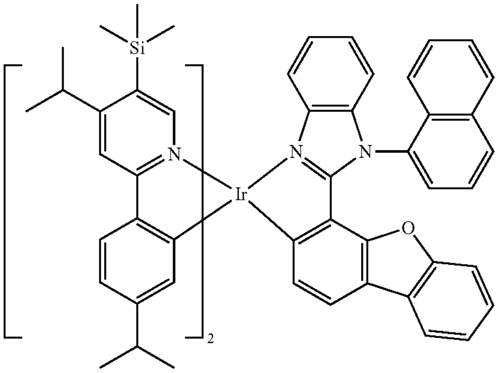

-continued
261
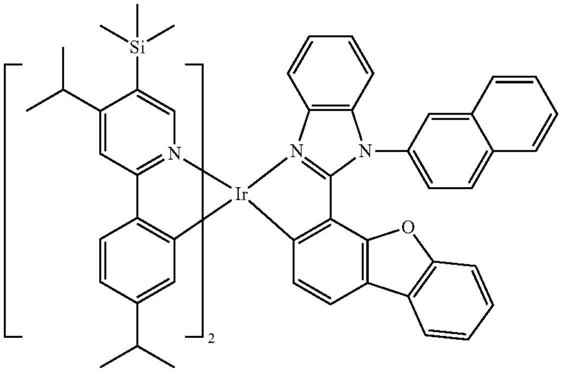
262
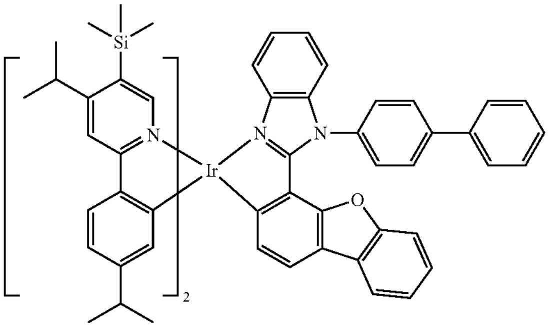
263
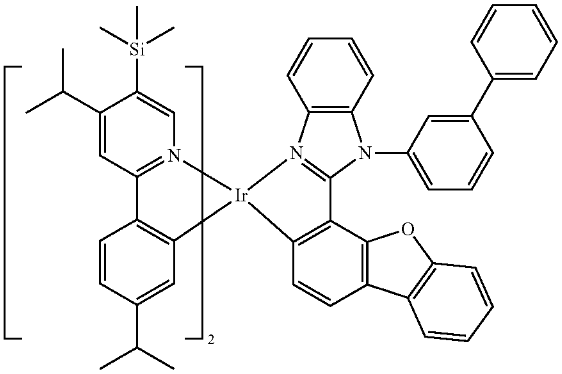
264
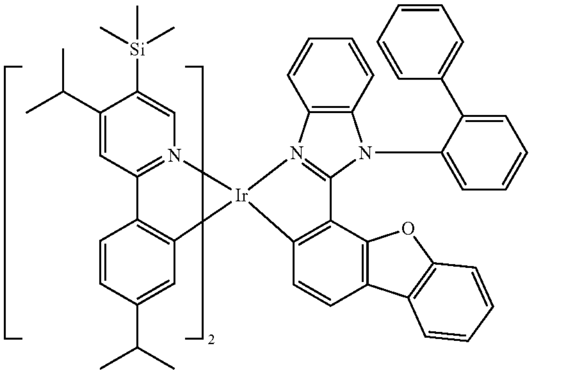
-continued
265
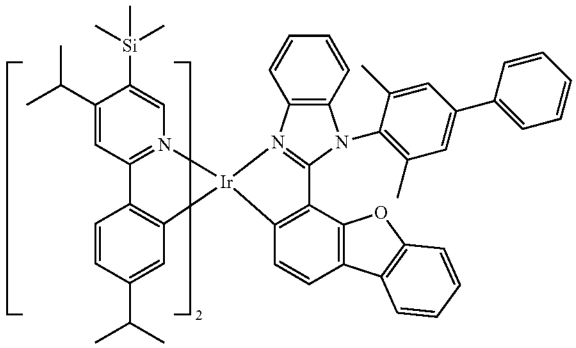
266
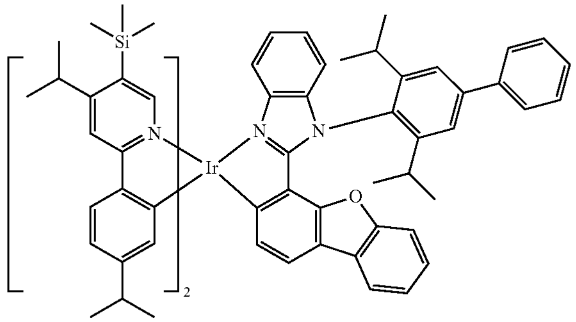
267
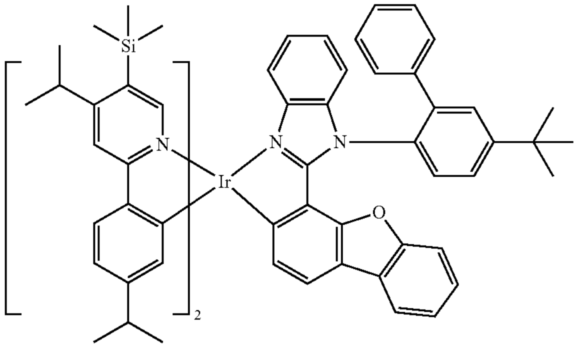
268
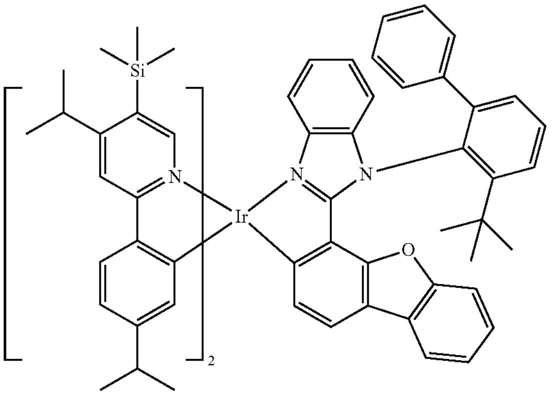

-continued
269
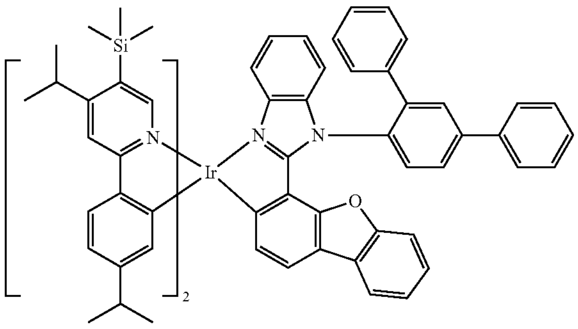
270
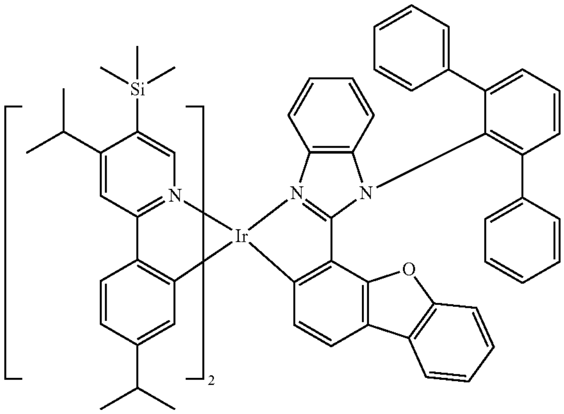
271
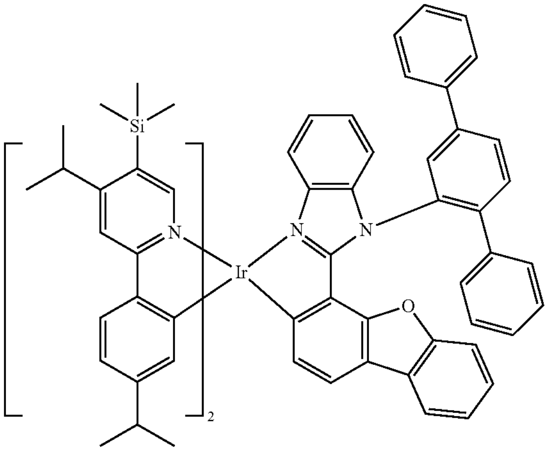
272
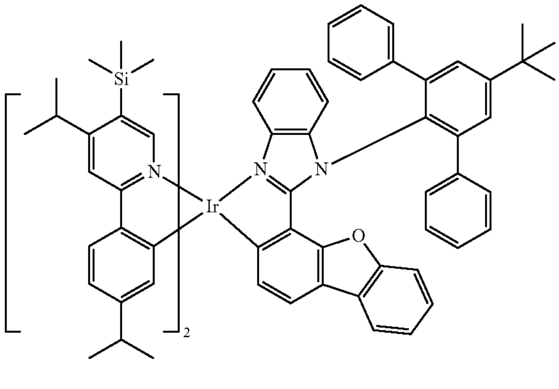
-continued
273
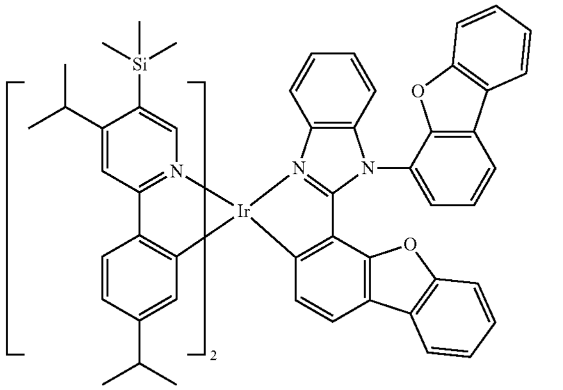
274
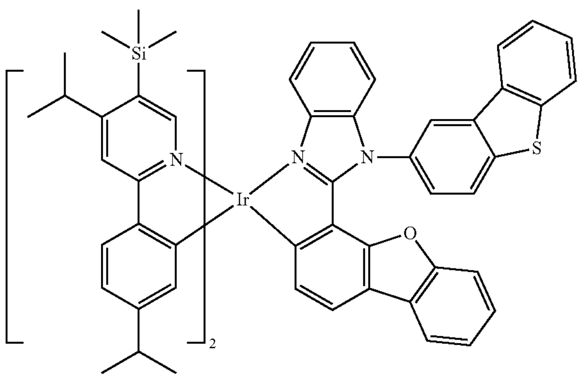
275
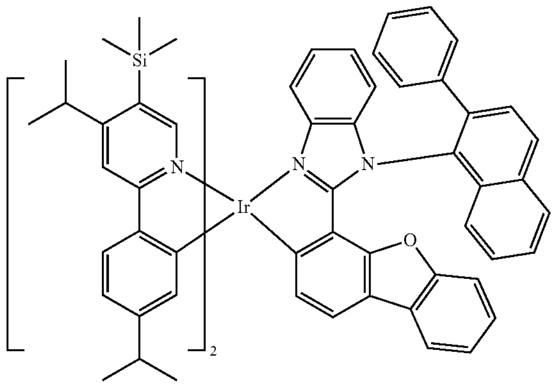
276
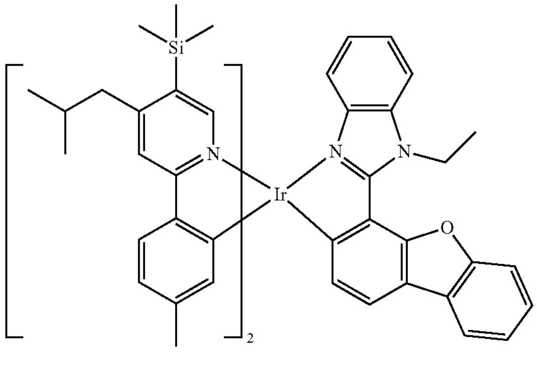

-continued
277
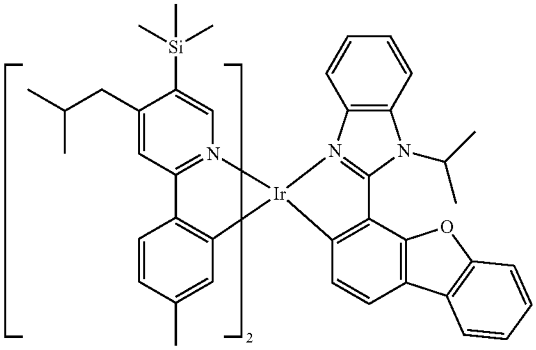
278
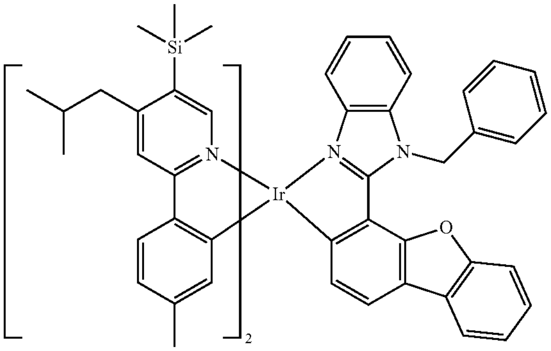
279
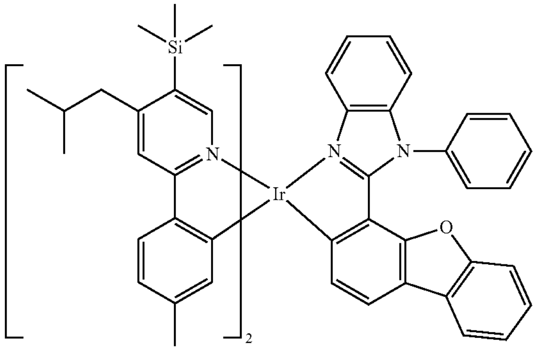
280
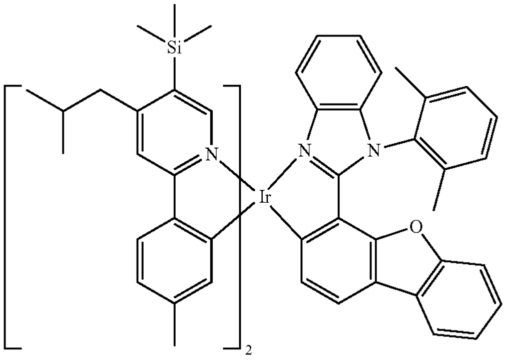
-continued
281
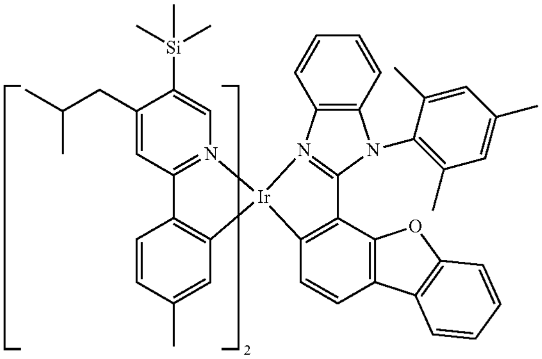
282
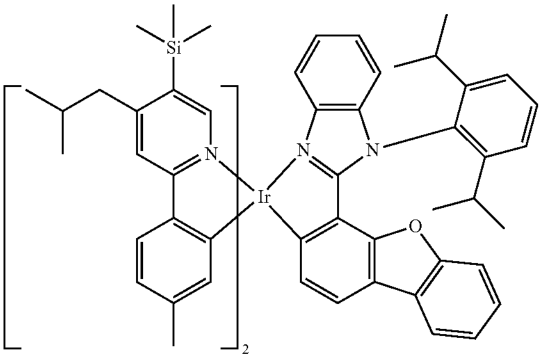
283
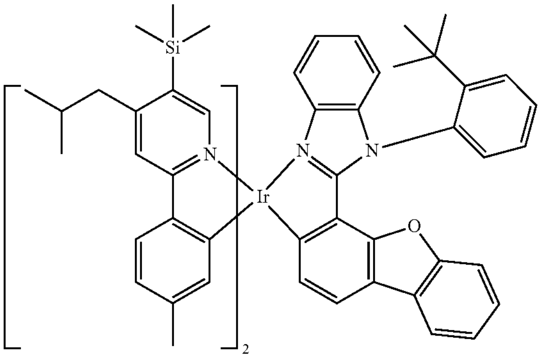
284
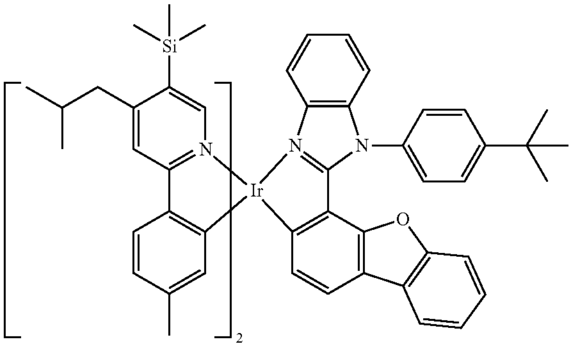

-continued
285
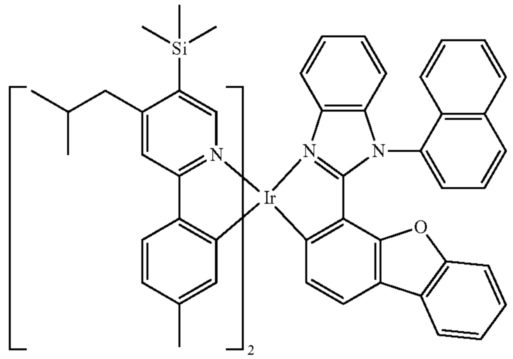
286
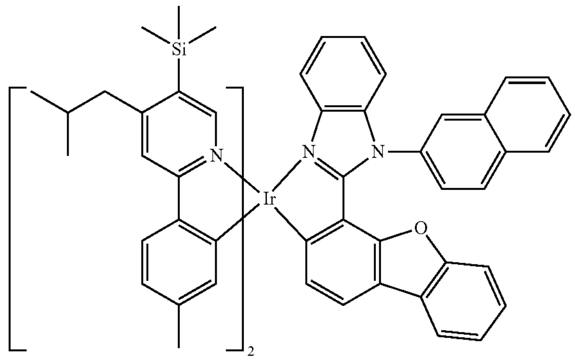
287
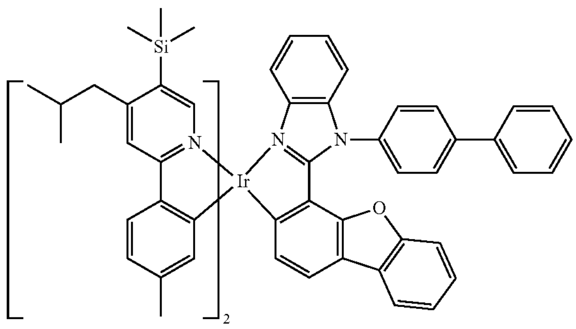
288
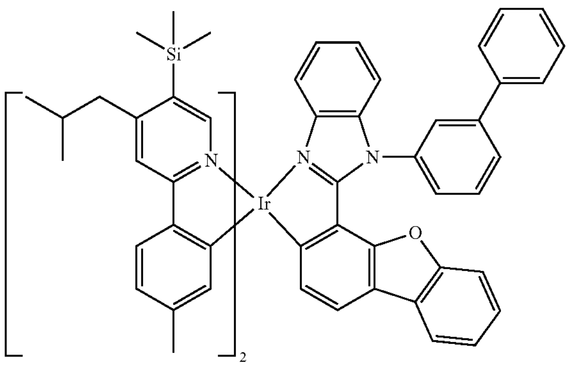
-continued
289
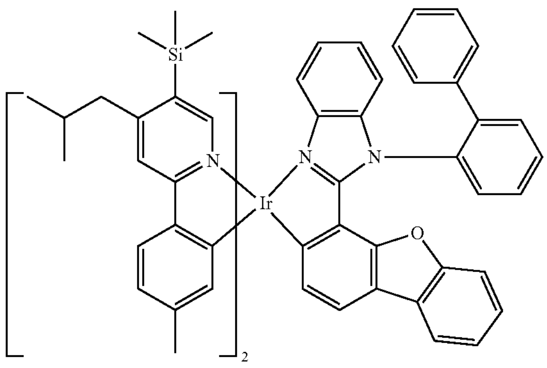
290
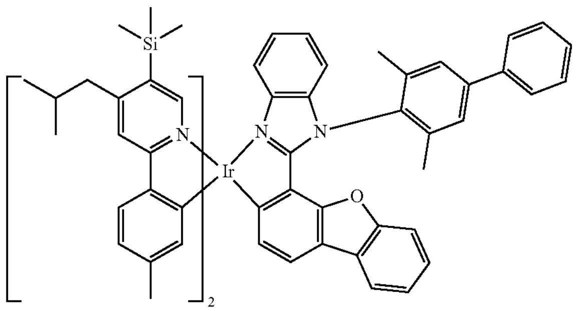
291
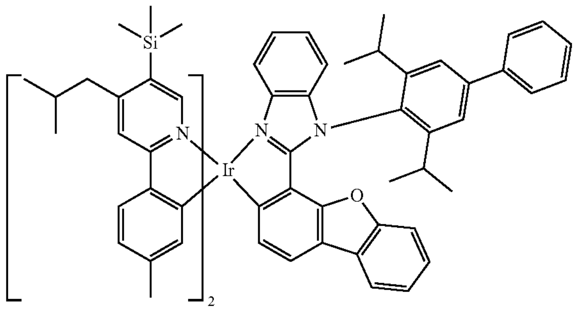
292
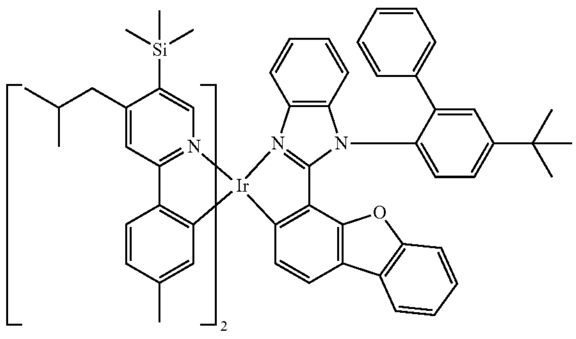

-continued
293
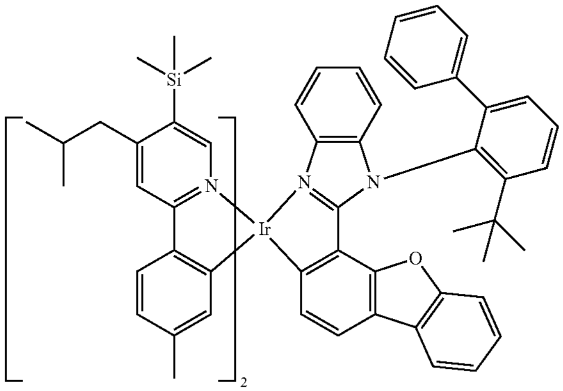
294
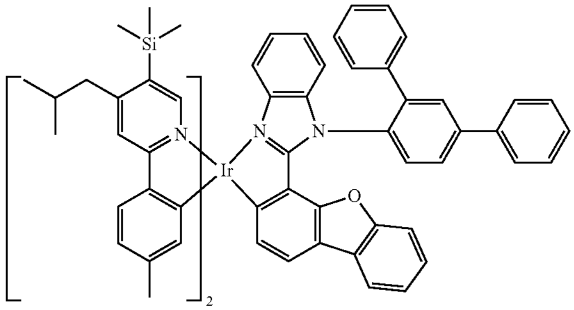
295
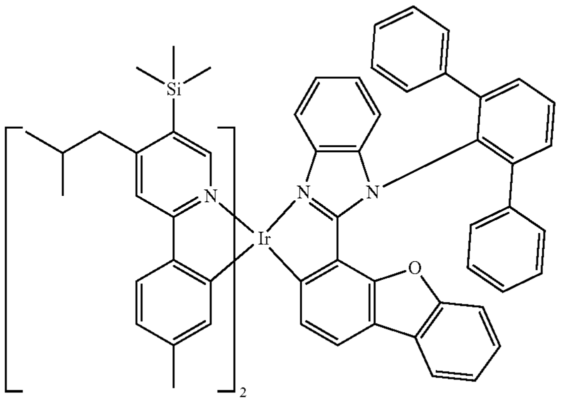
296
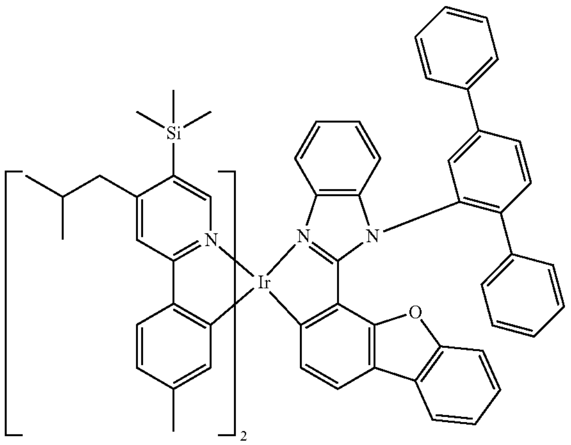
-continued
297
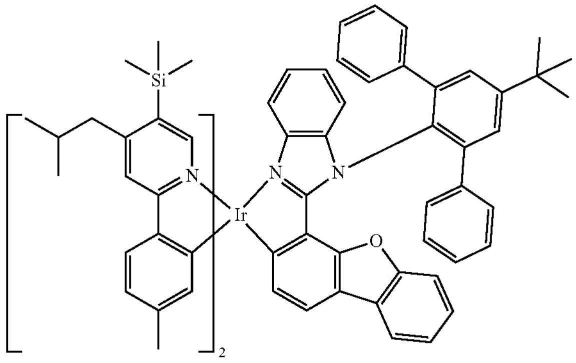
298
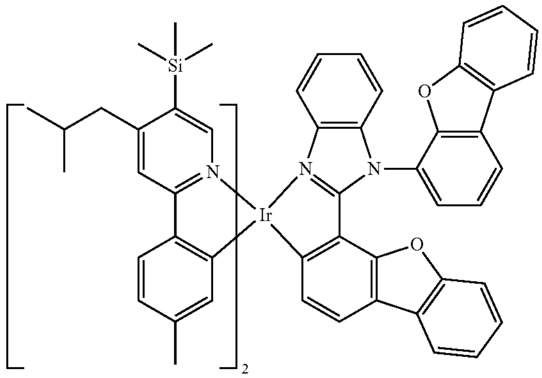
299
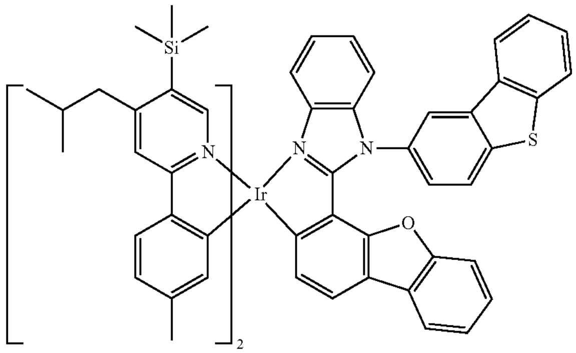
300
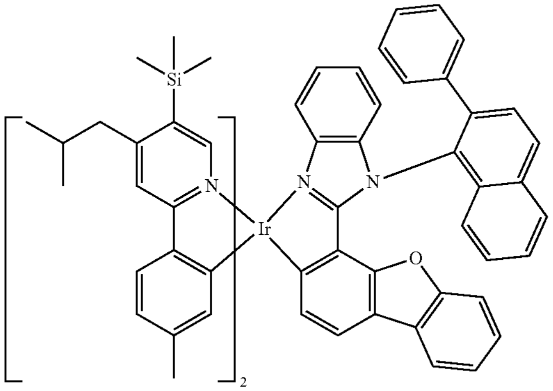

-continued
301
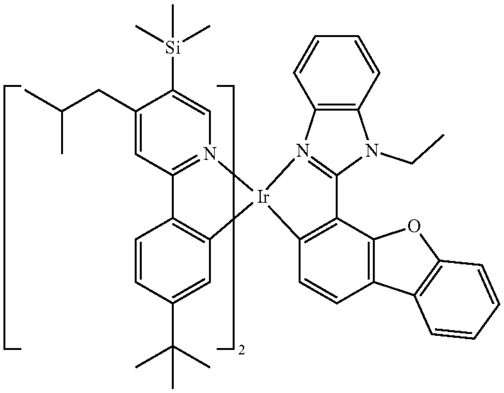
302
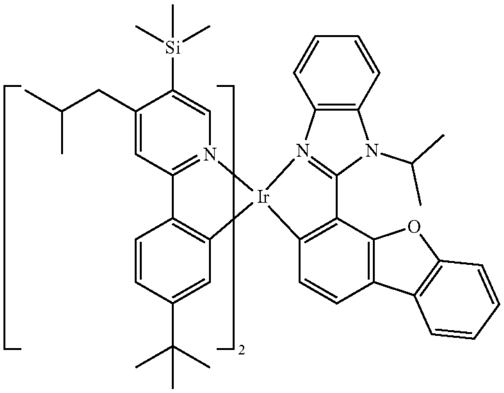
303
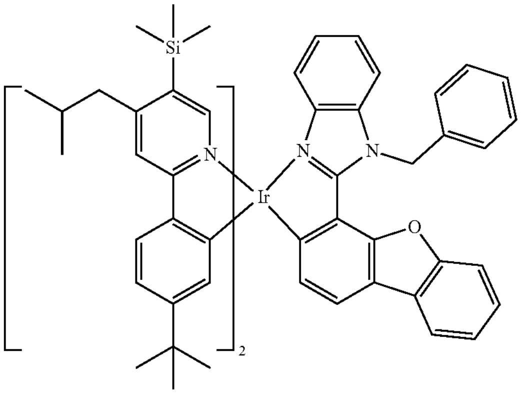
304
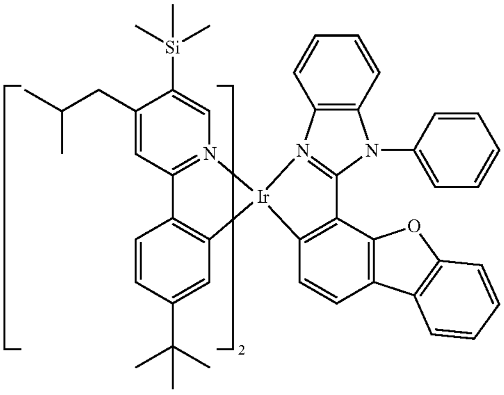
-continued
305
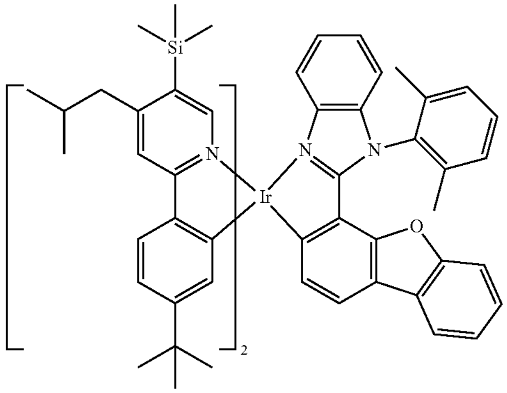
306
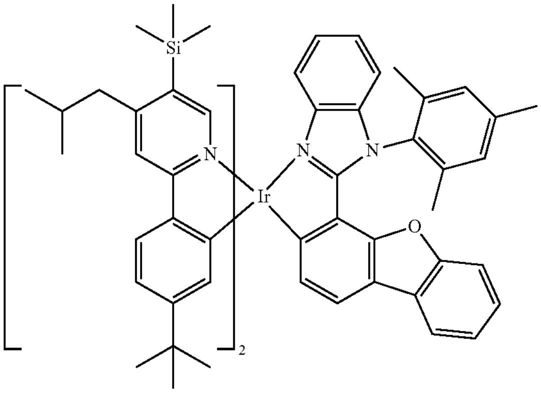
307
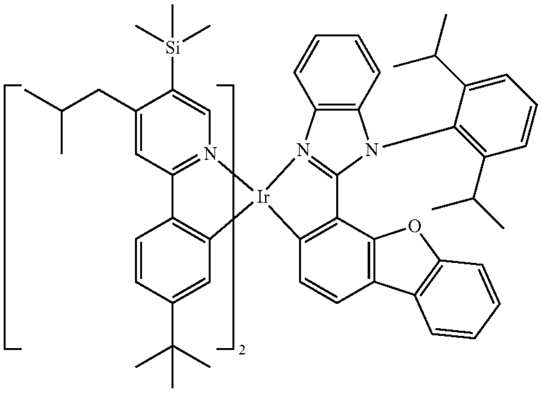
308
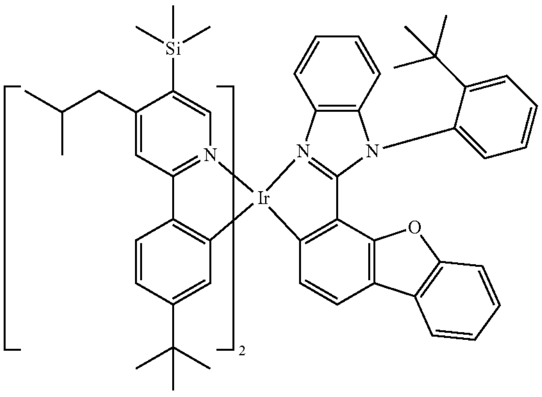

-continued
309
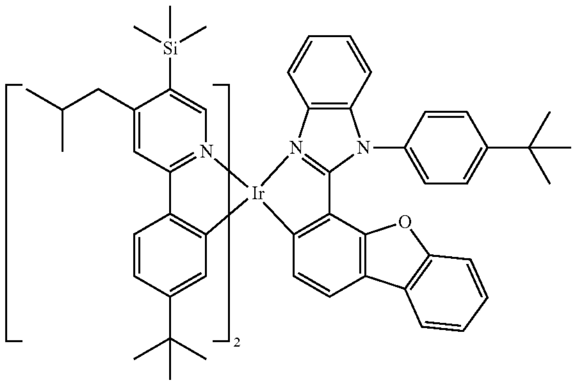
310
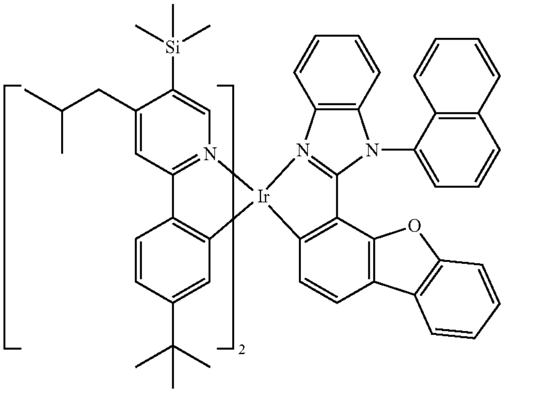
311
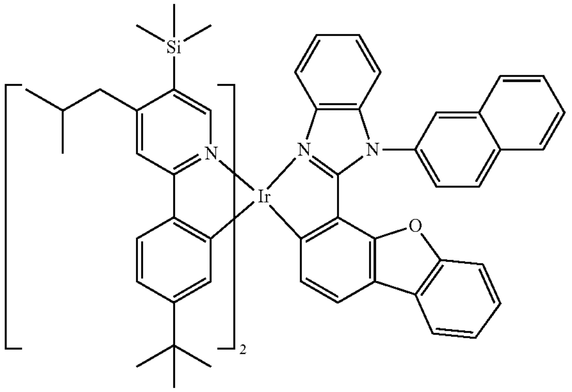
312
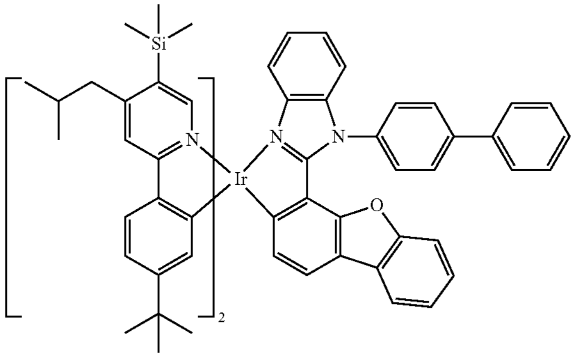
-continued
313
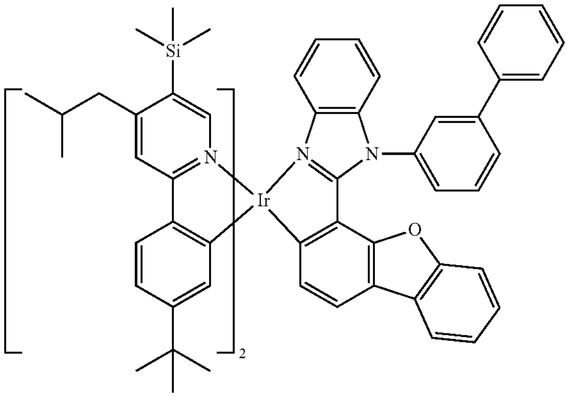
314
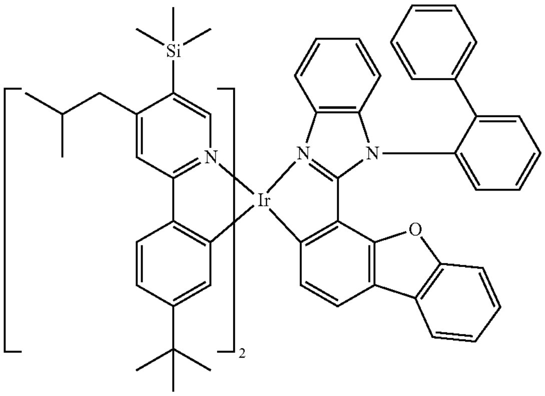
315
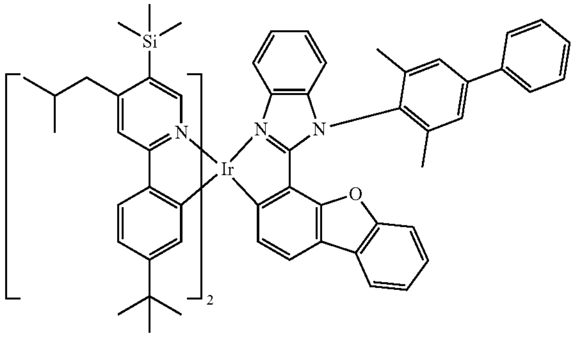
316
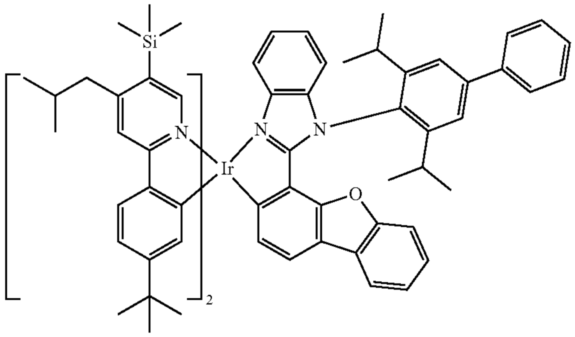

-continued
317
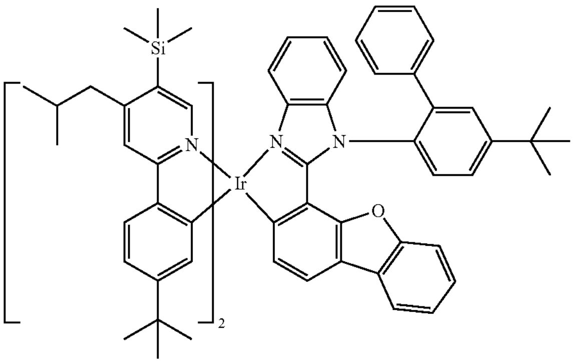
318
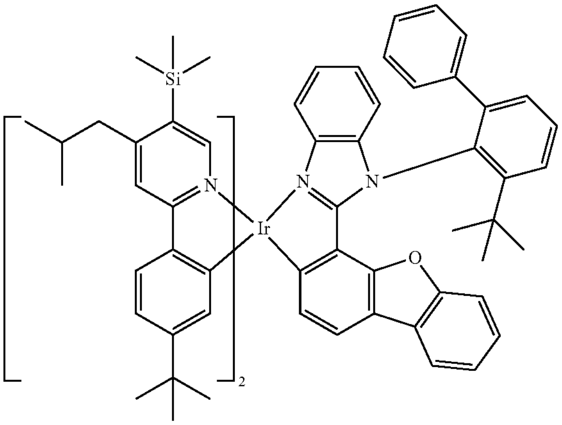
319
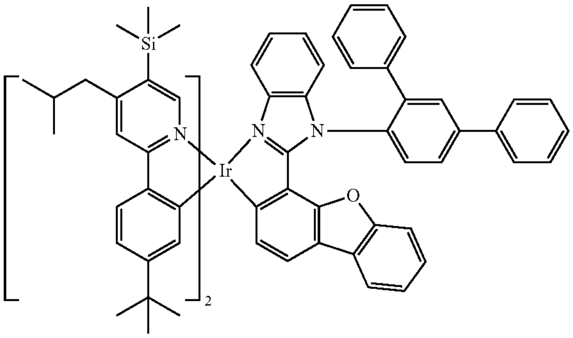
320
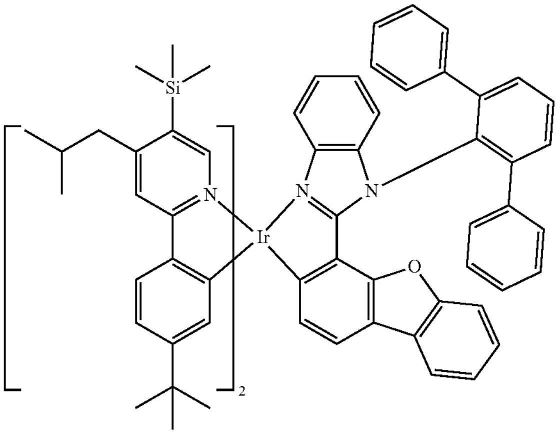
-continued
321
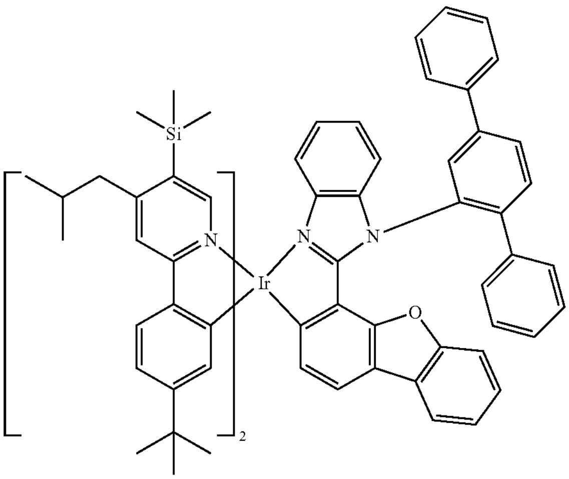
322
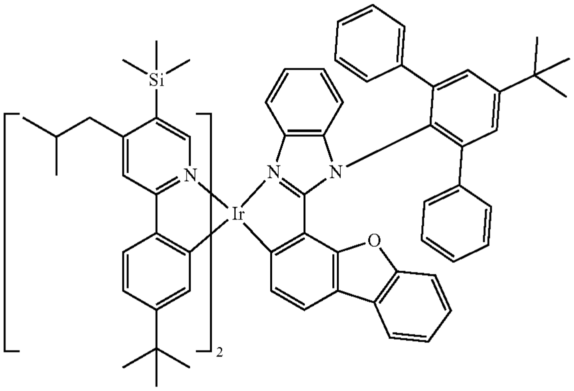
323
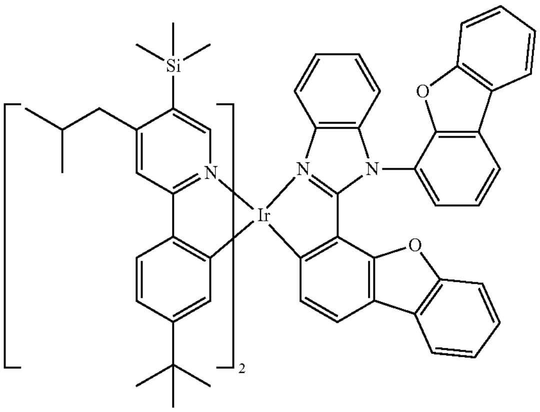

-continued
324
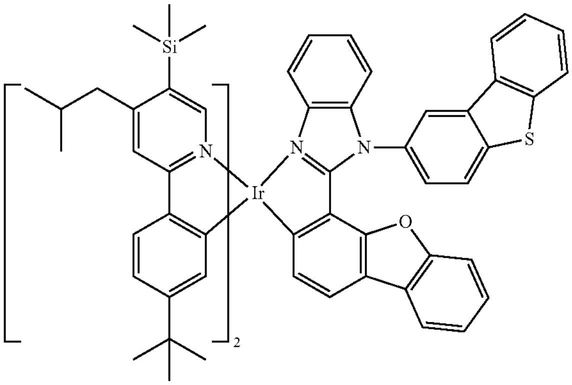
325
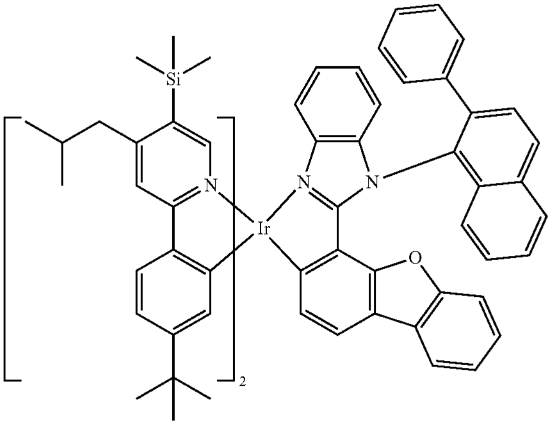
326
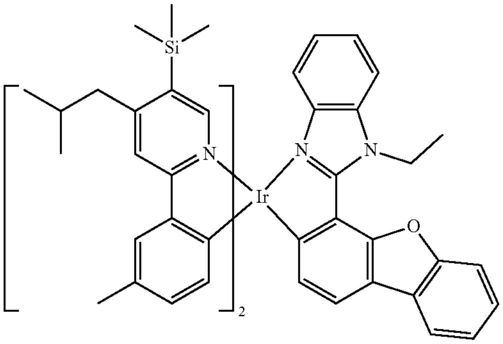
327
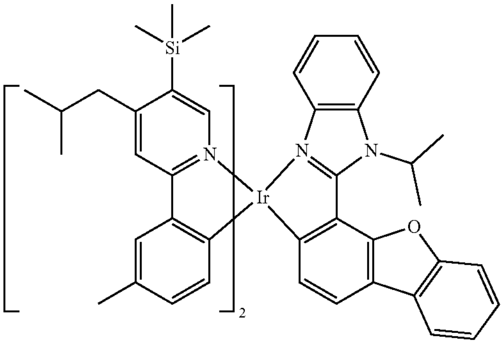
-continued
328
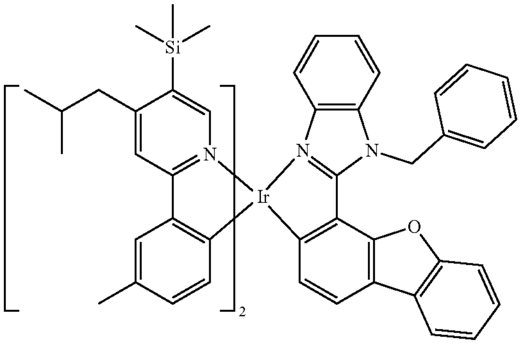
329
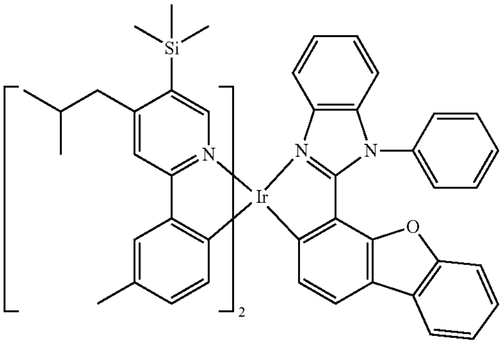
330
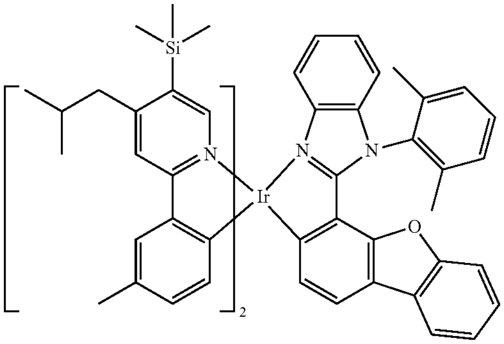
331
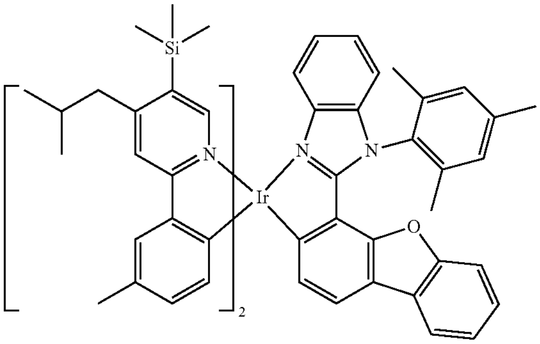

-continued
332
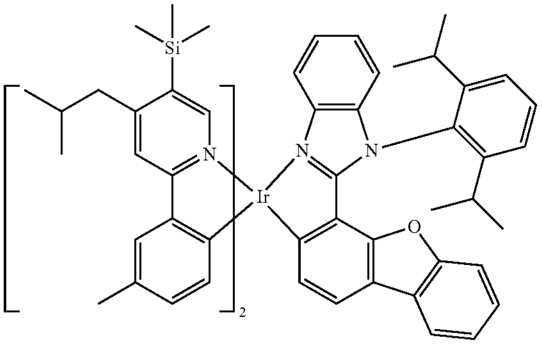
333
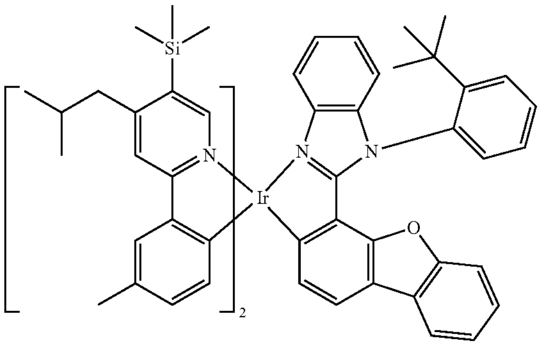
334
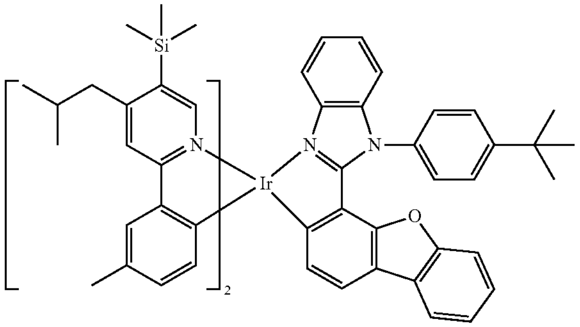
335
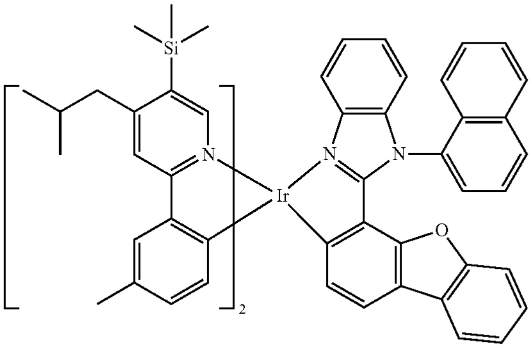
-continued
336
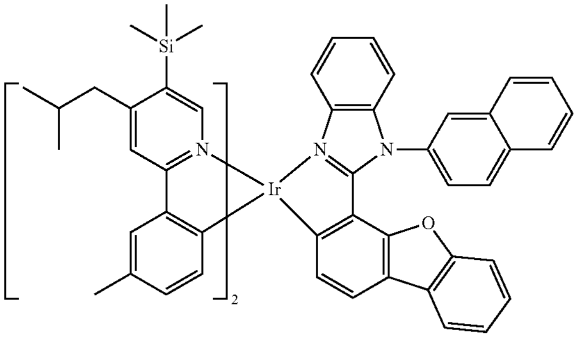
337
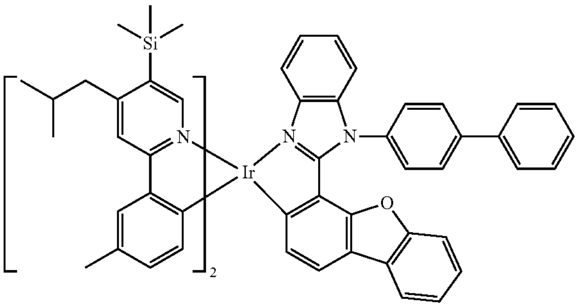
338
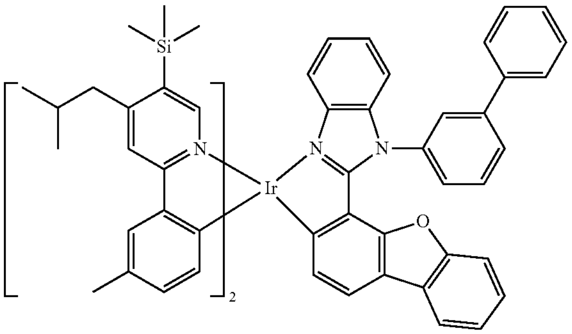
339
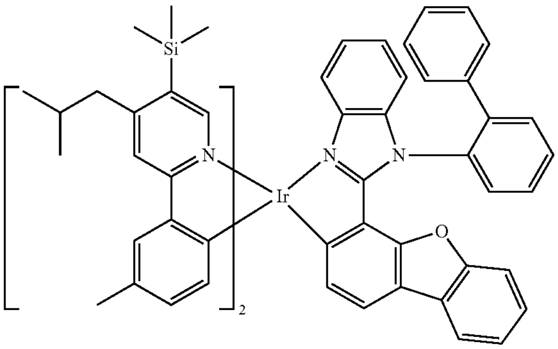

-continued
340
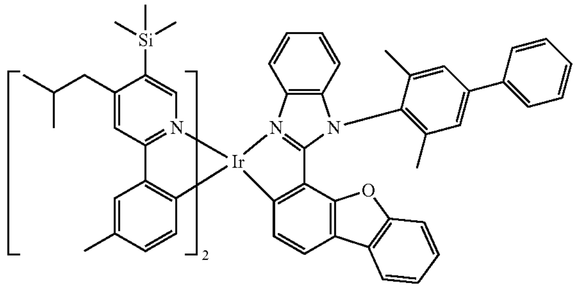
341
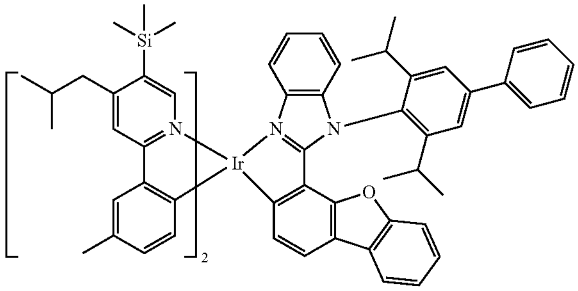
342
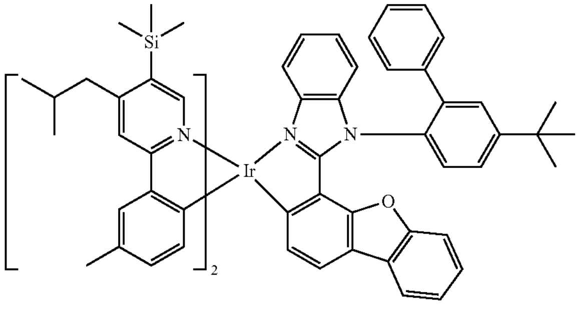
343
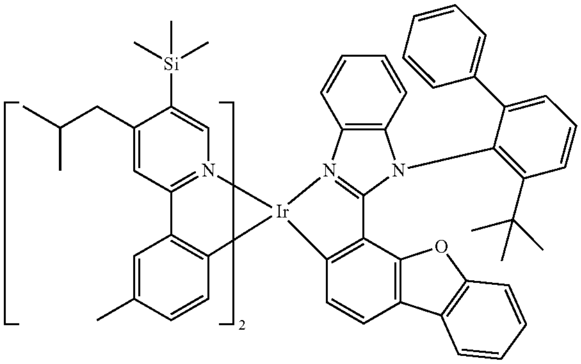
-continued
343
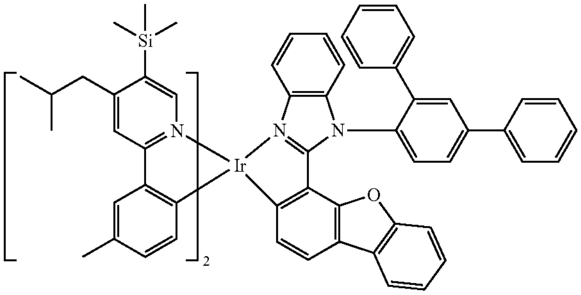
345
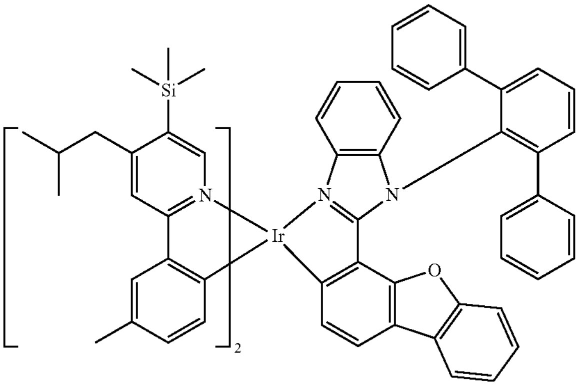
346
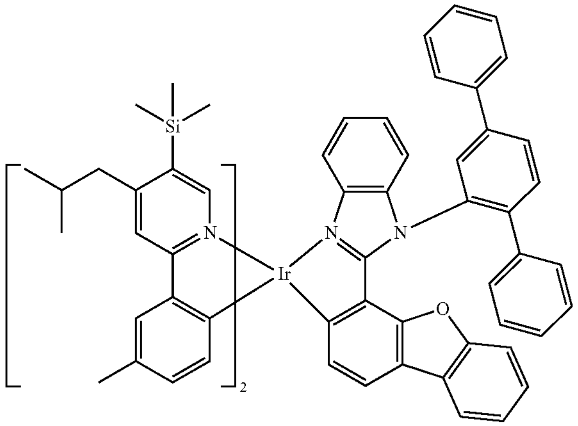
347
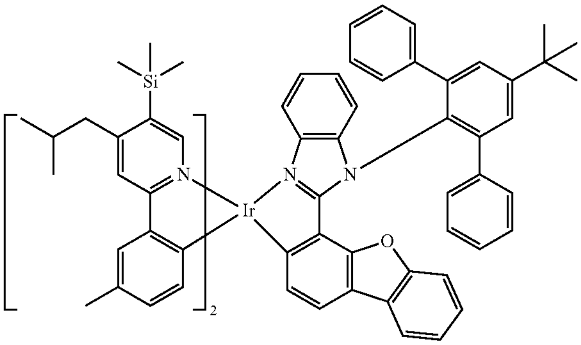

-continued
348
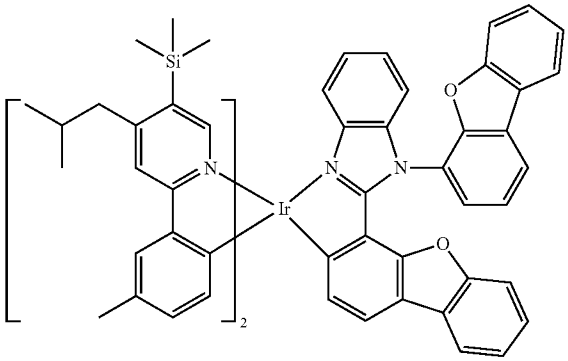
349
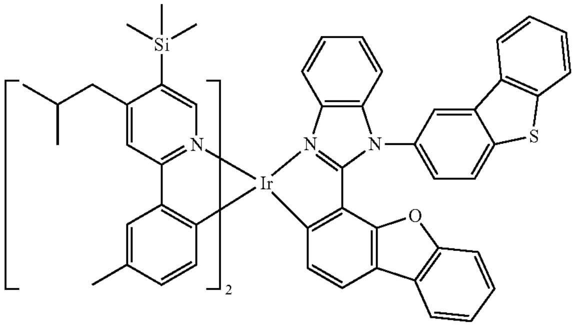
350
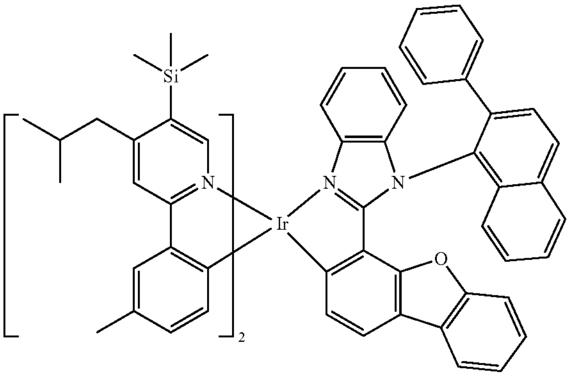
351
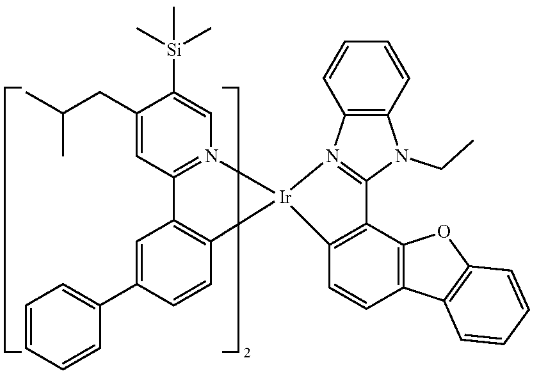
-continued
352
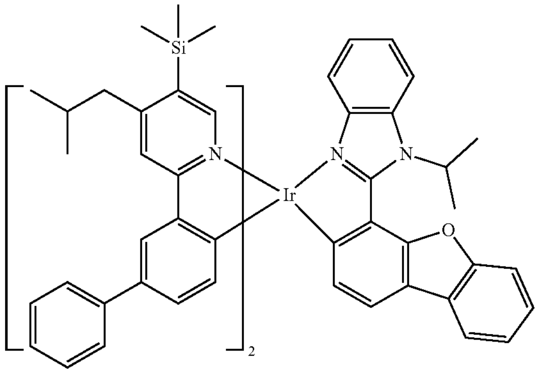
353
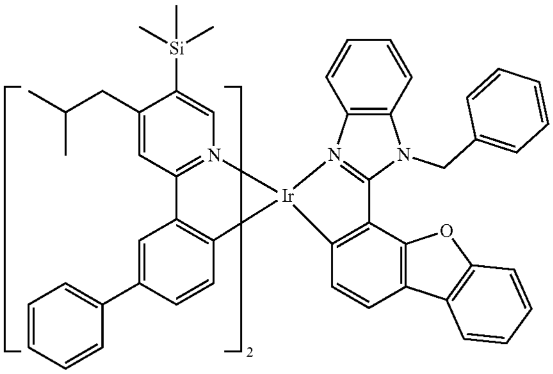
354
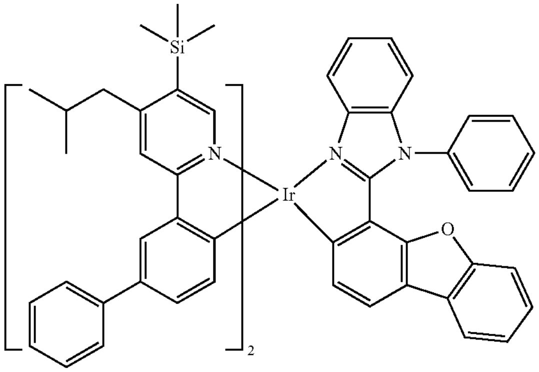
355
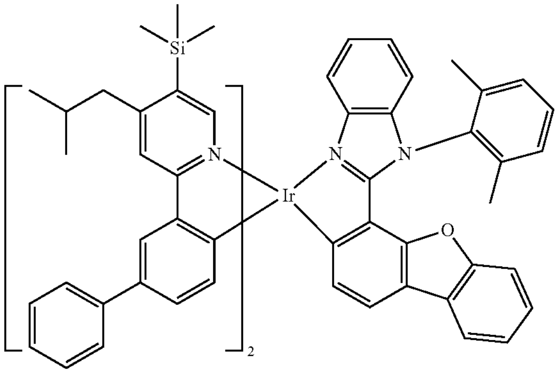

-continued
356
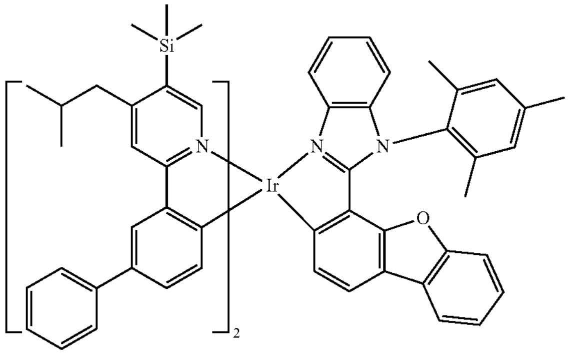
357
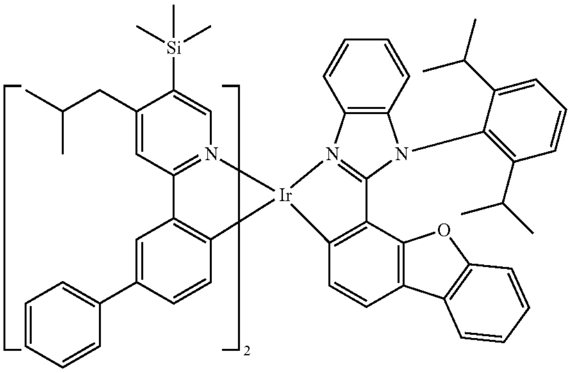
358
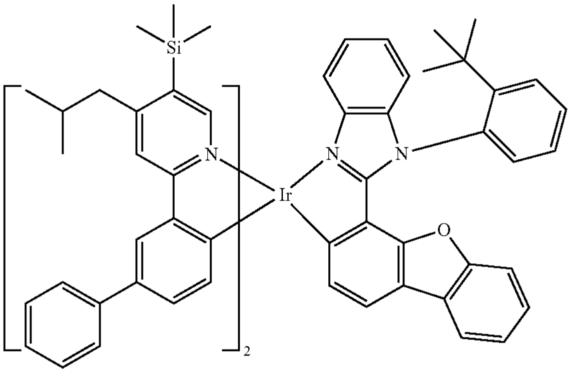
359
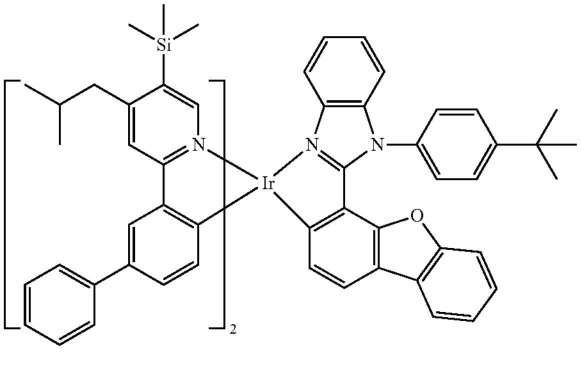
-continued
360
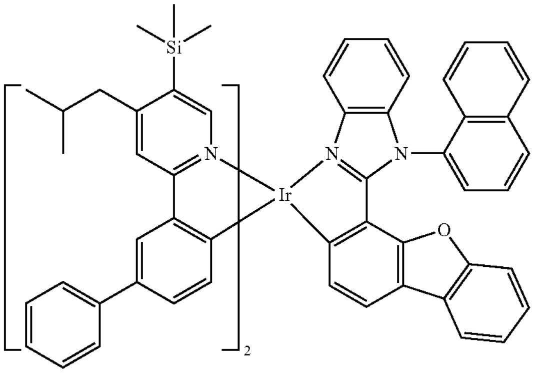
361
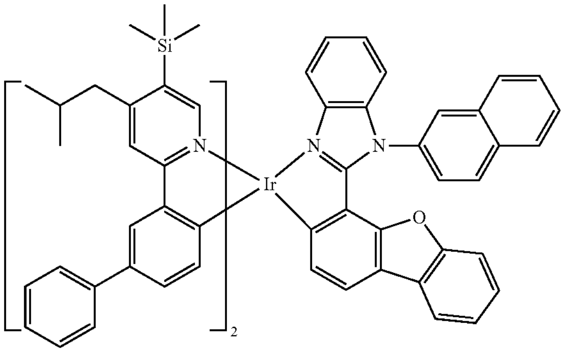
362
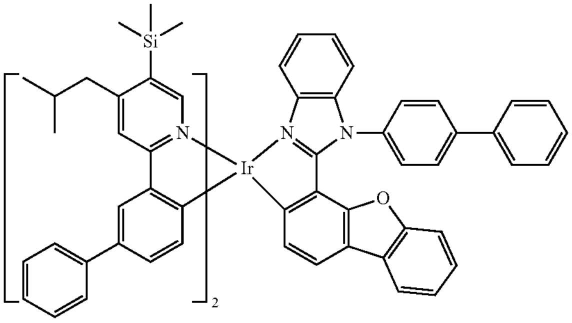
363
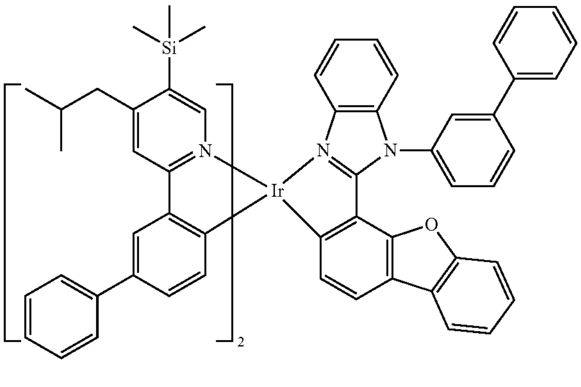

-continued
364
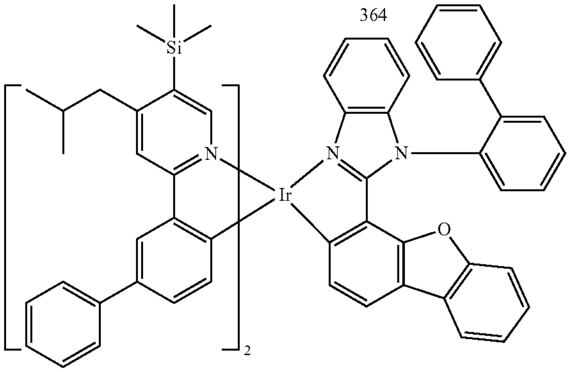
365
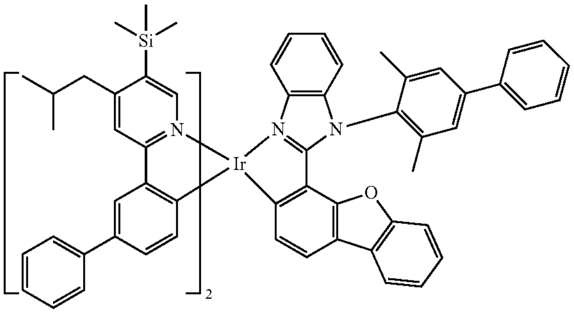
366
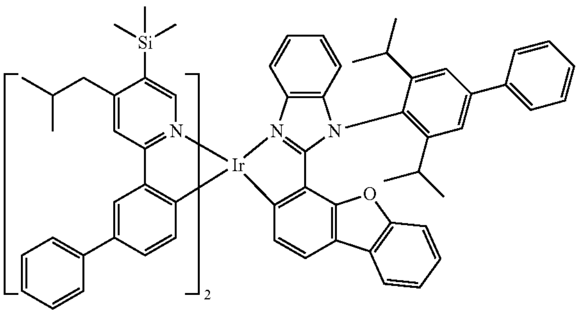
367
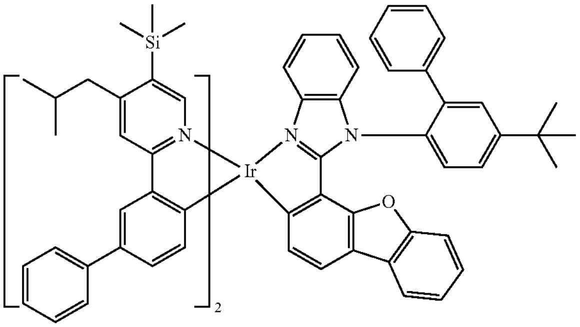
-continued
368
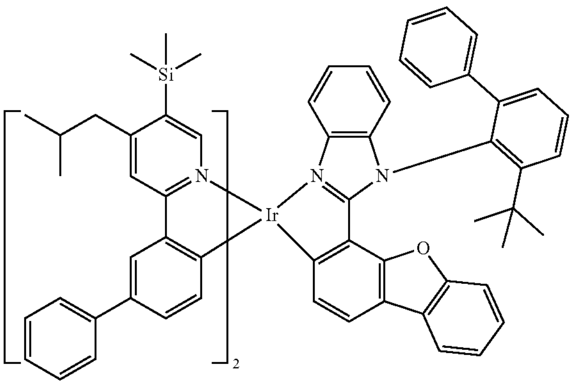
369
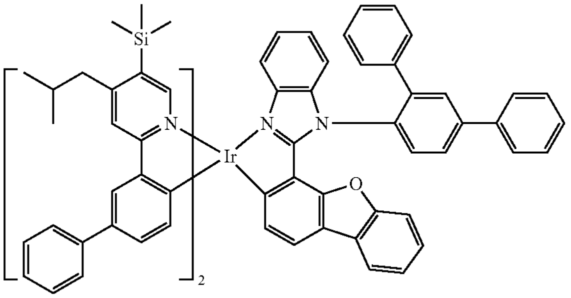
370
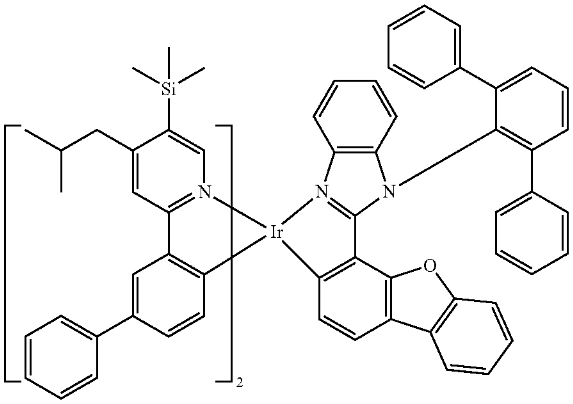
371
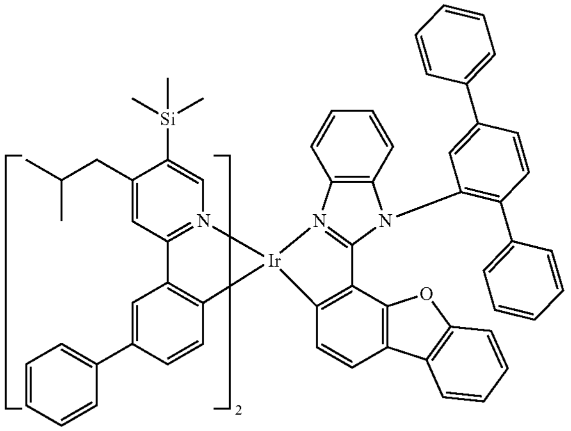

-continued
372
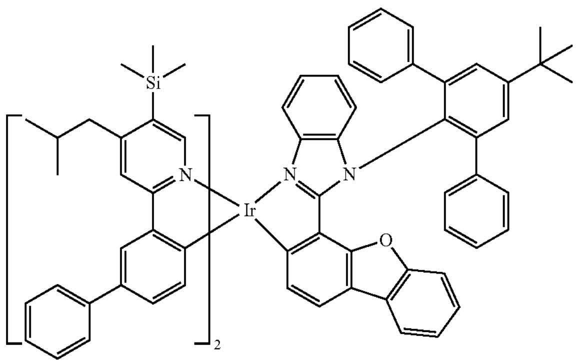
373
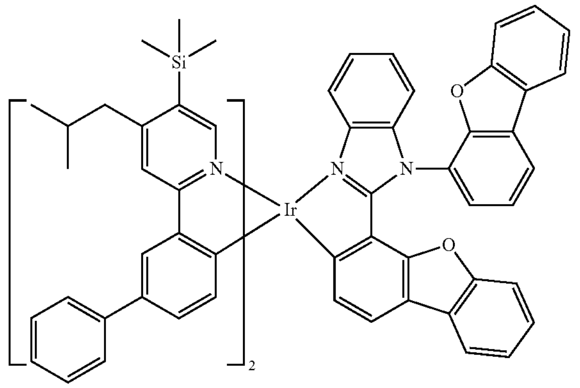
374
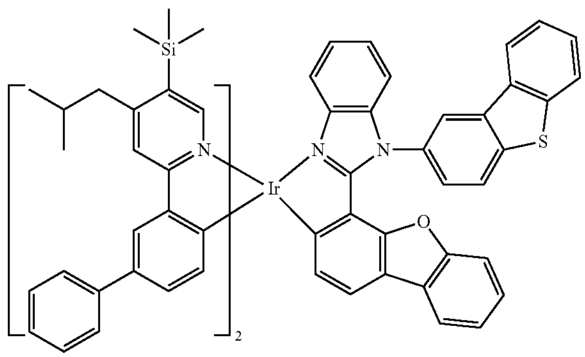
375
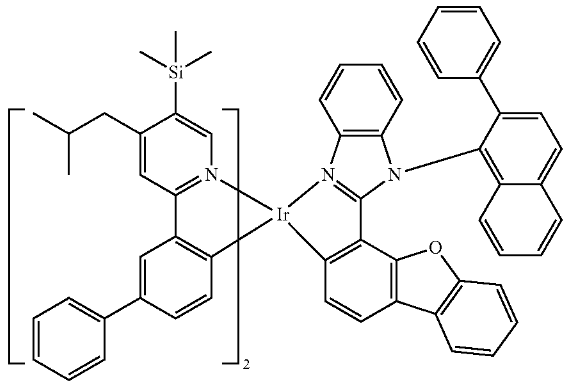
-continued
376
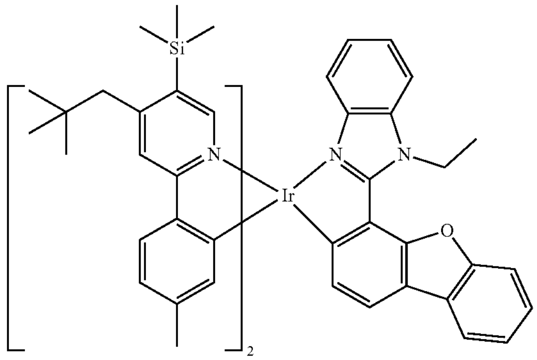
377
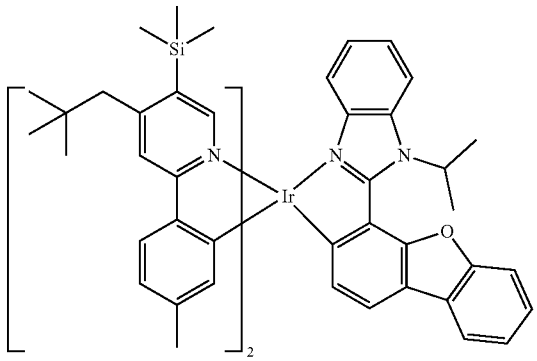
378
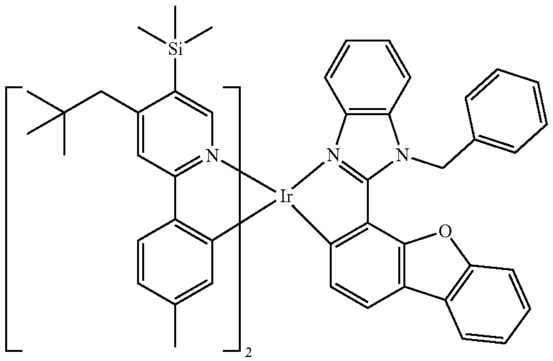
379
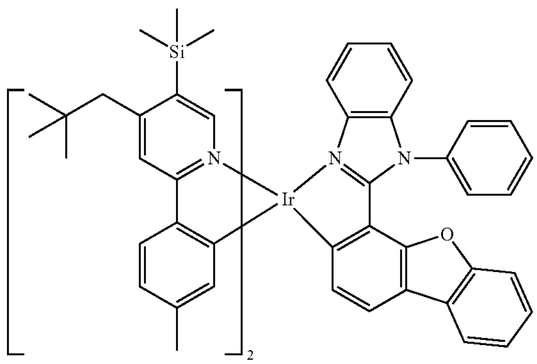

-continued
380
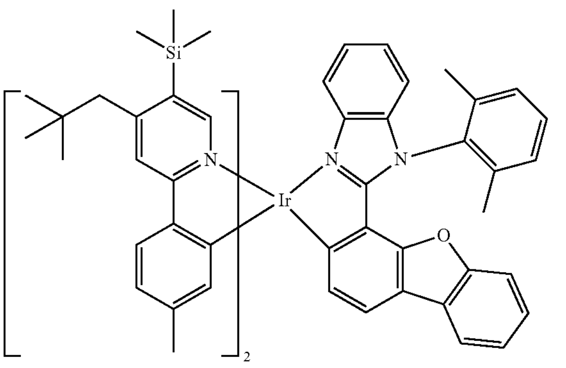
381
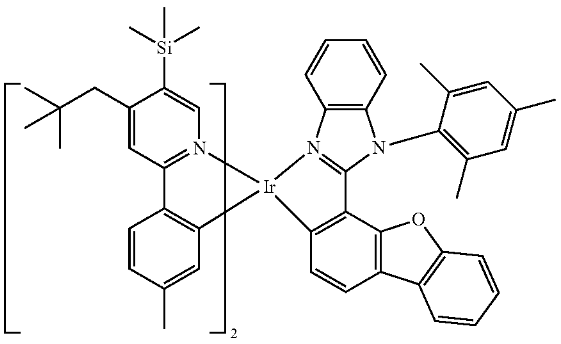
382
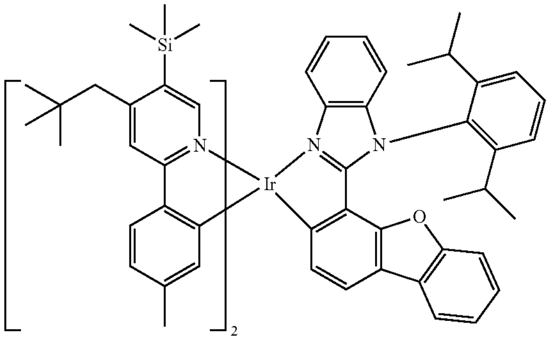
383
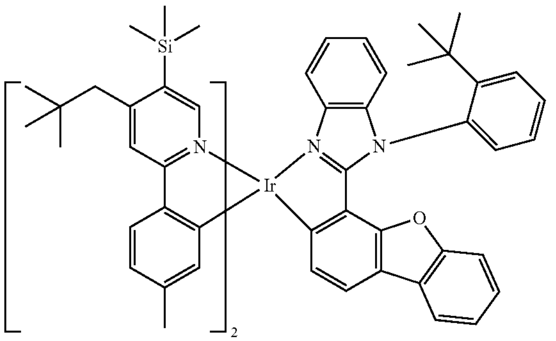
-continued
384
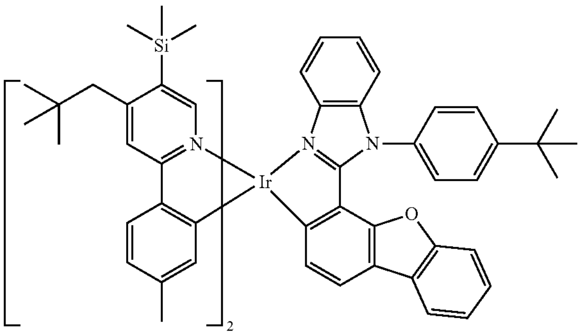
385
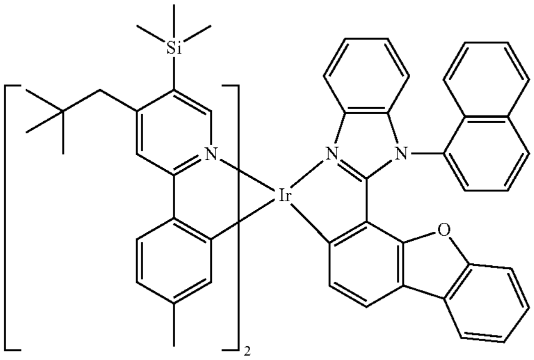
386
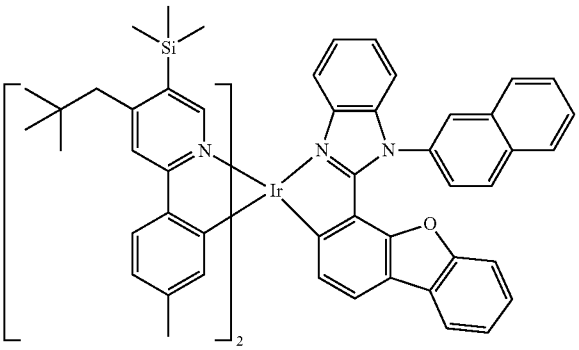
387
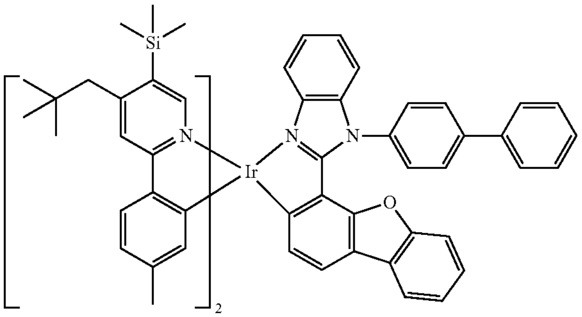

-continued
388
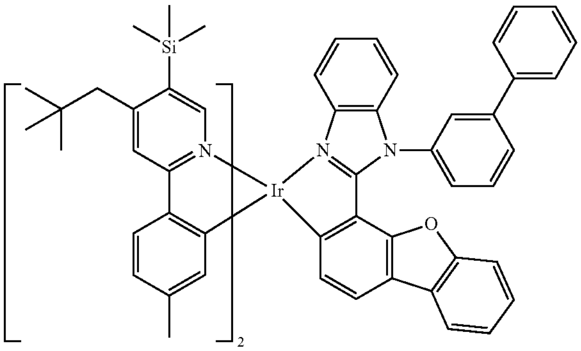
389
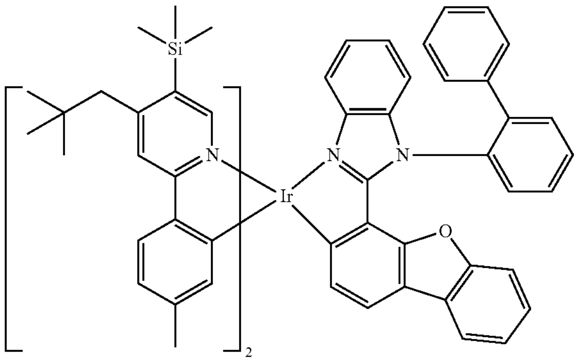
390
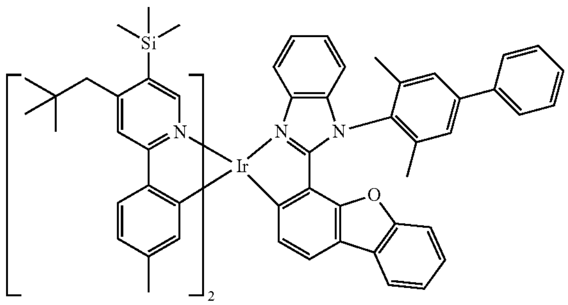
391
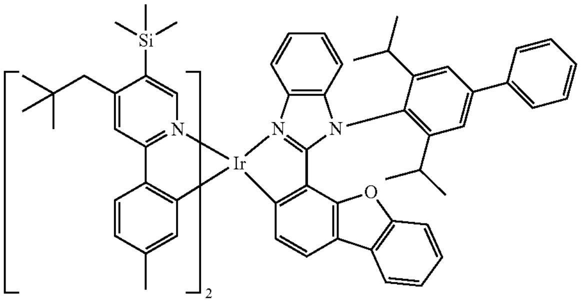
-continued
392
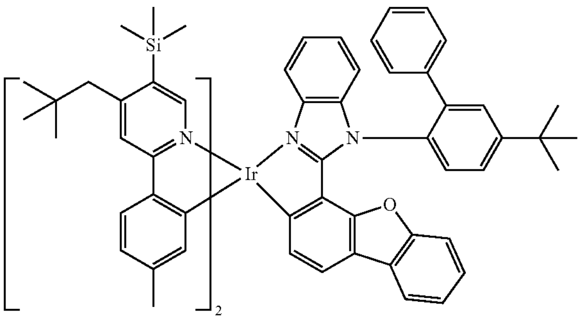
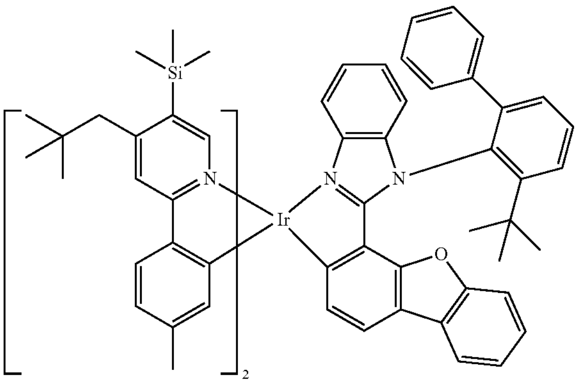
393
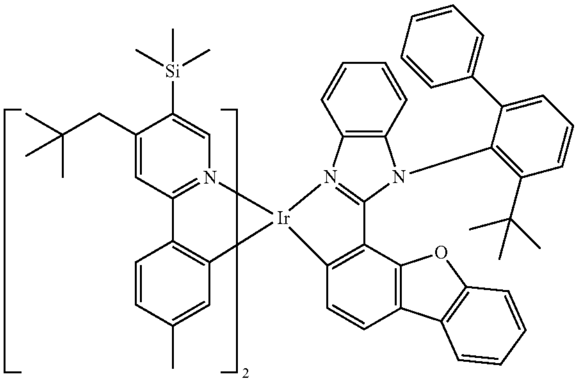
394
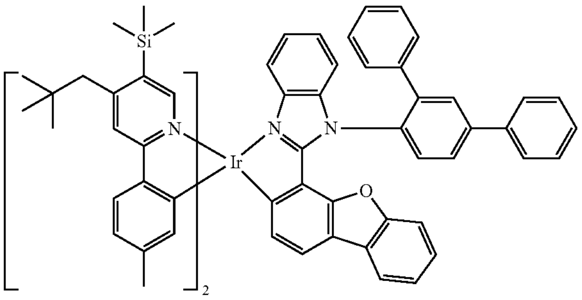

-continued
395
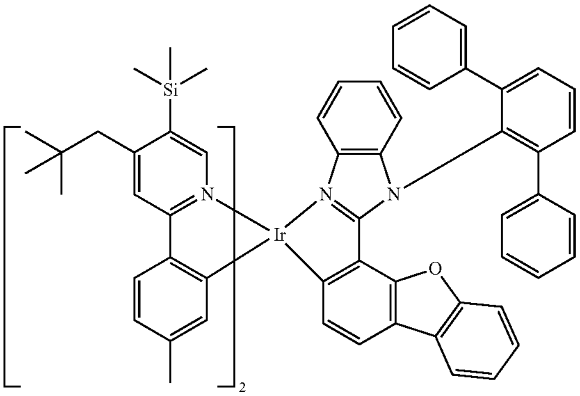
396
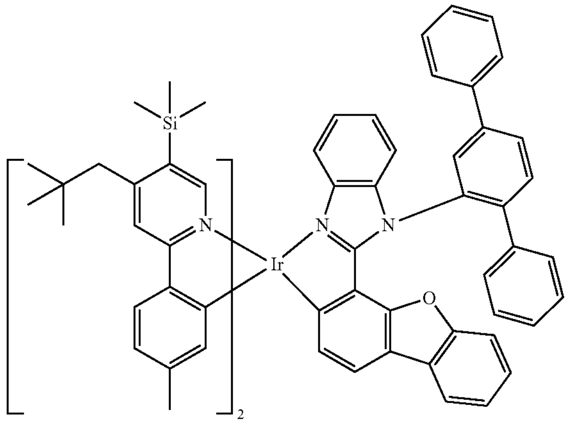
397
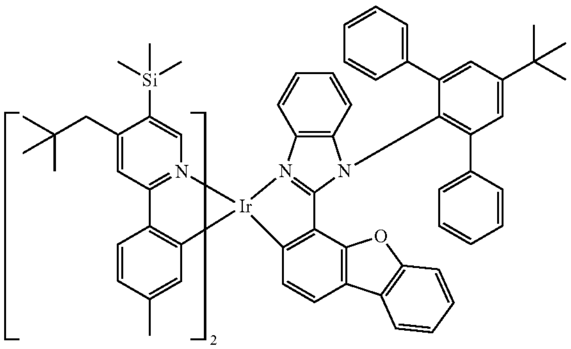
398
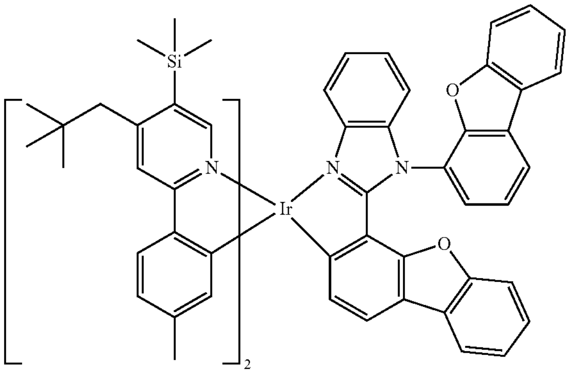
-continued
399
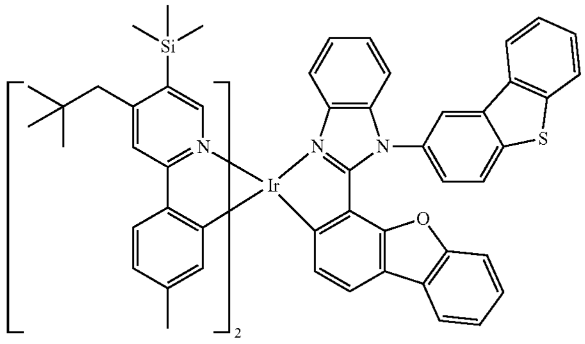
400
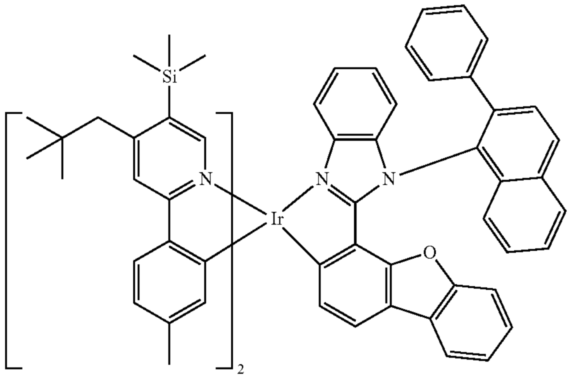
401
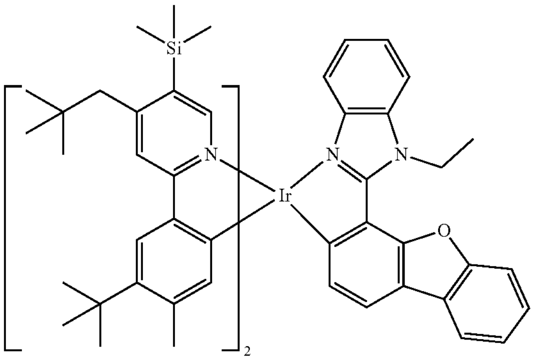
402
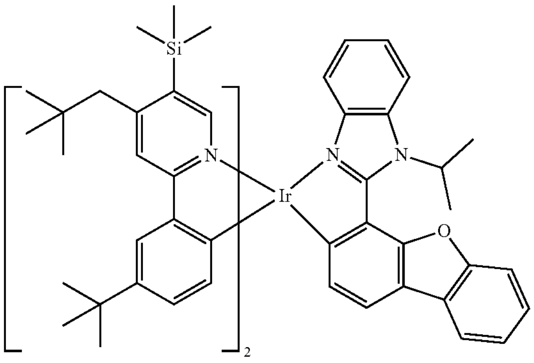

-continued
403
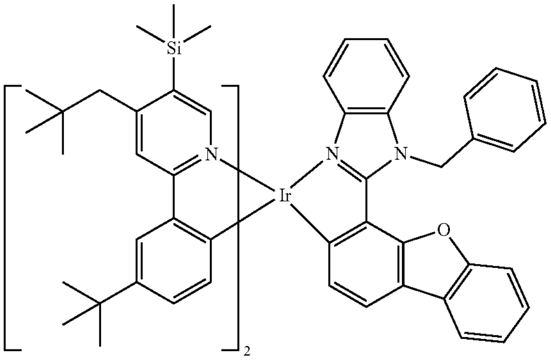
404
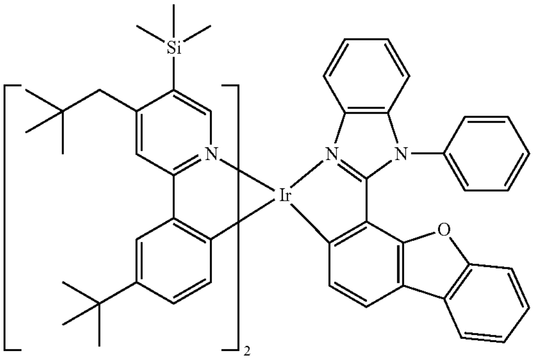
405
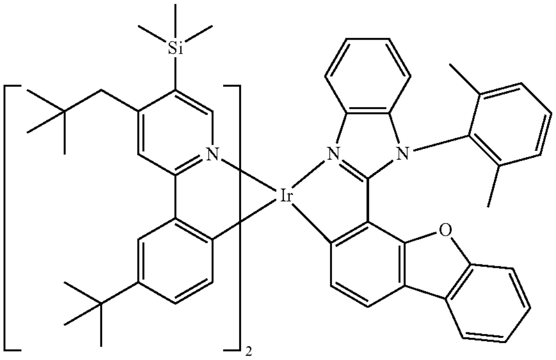
406
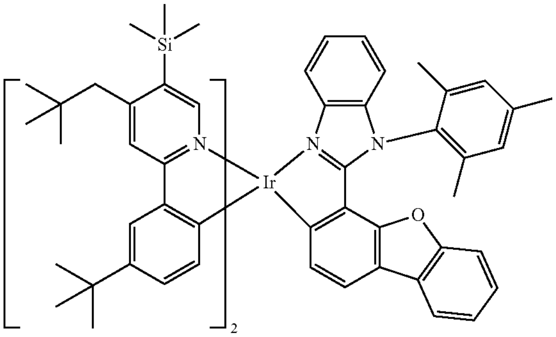
-continued
407
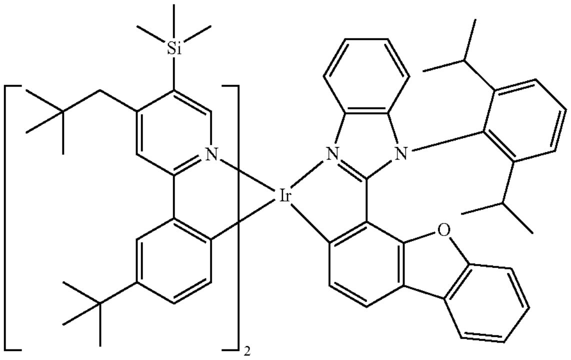
408
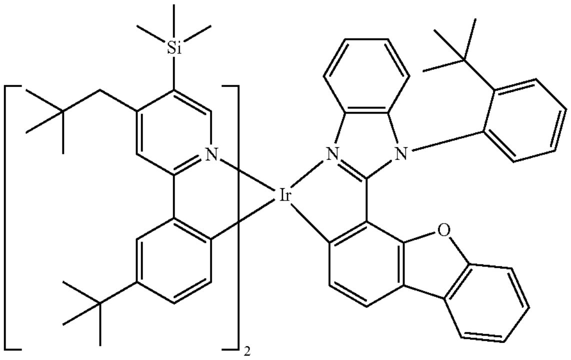
409
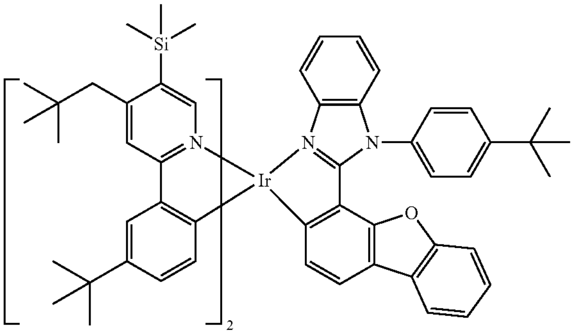
410
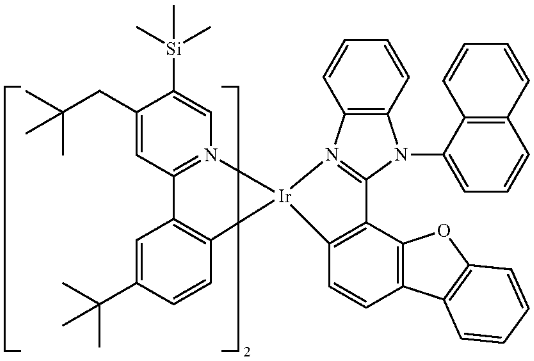

-continued
411
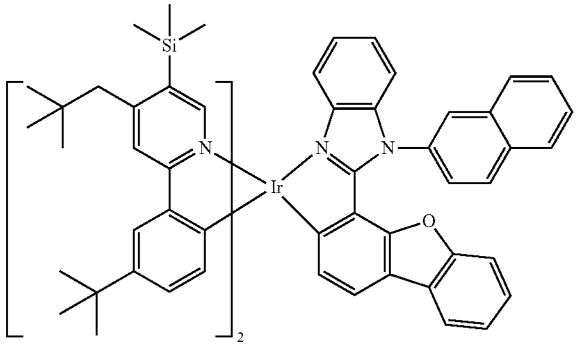
412
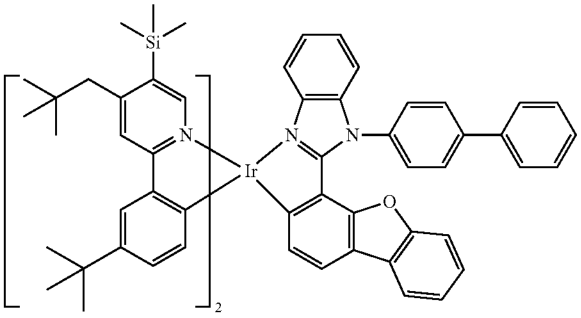
413
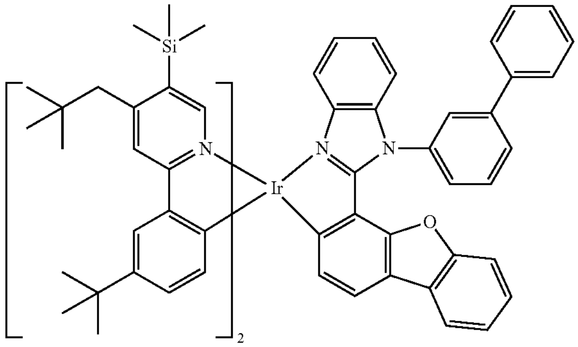
414
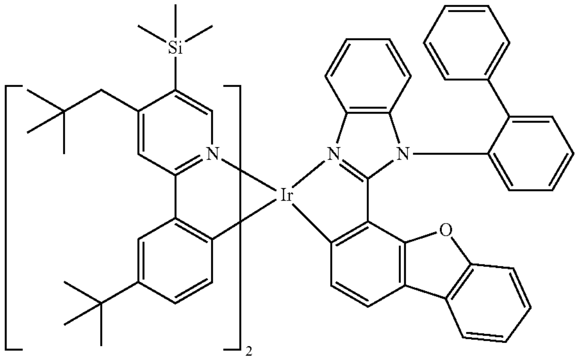
-continued
415
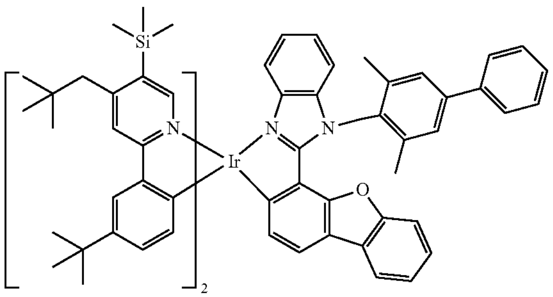
416
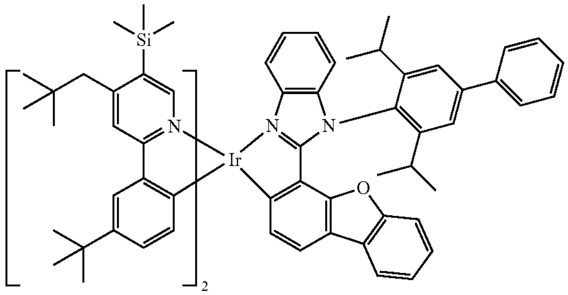
417
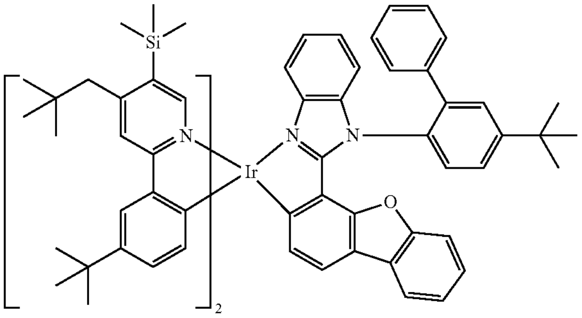
418
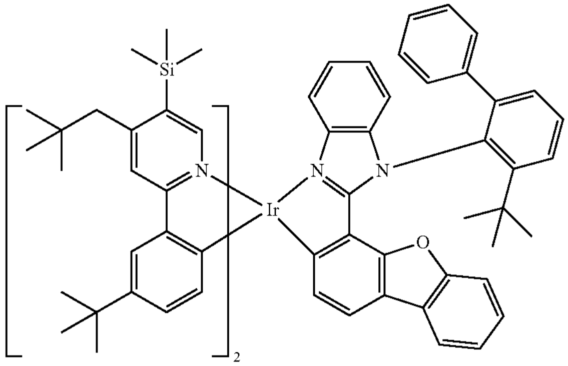

-continued
419
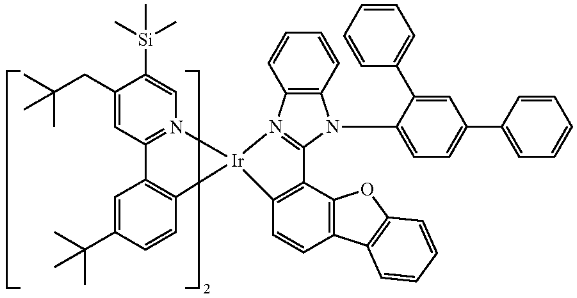
420
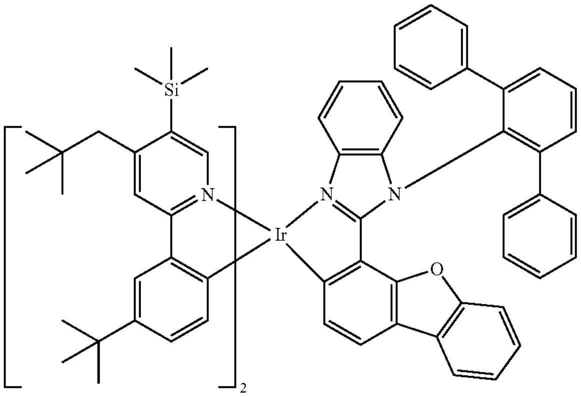
421
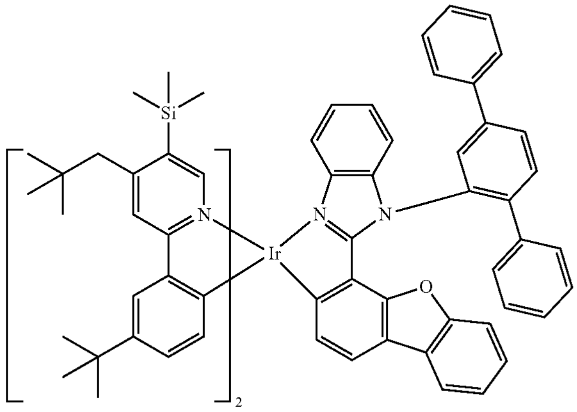
422
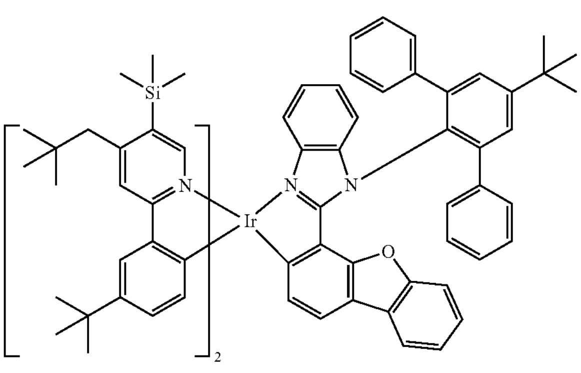
-continued
423
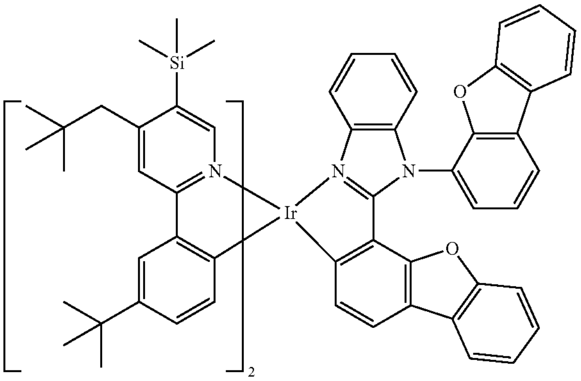
424
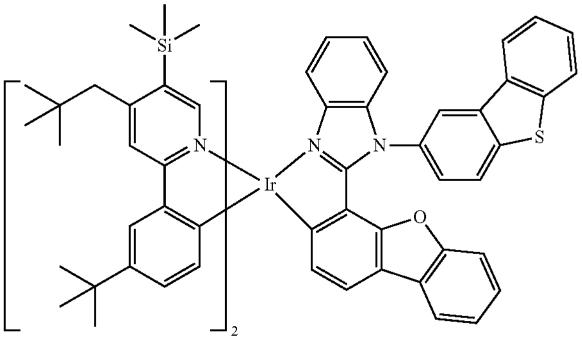
425
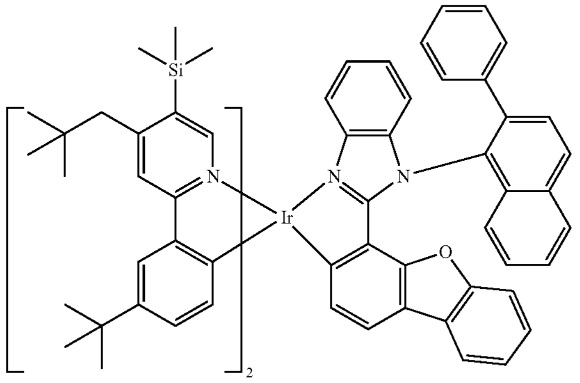
426
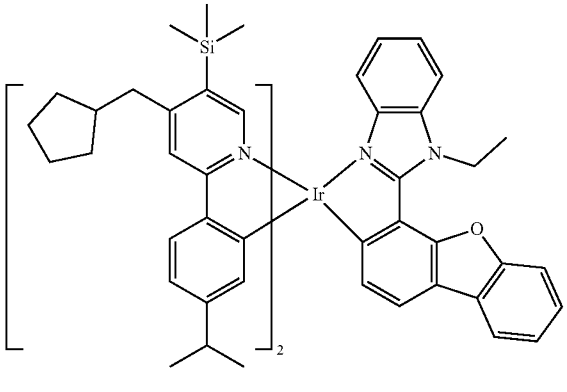

-continued
427
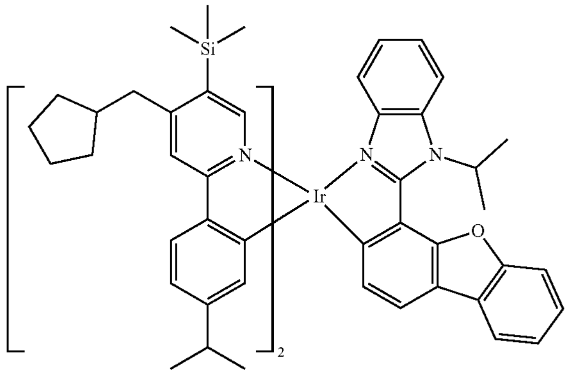
428
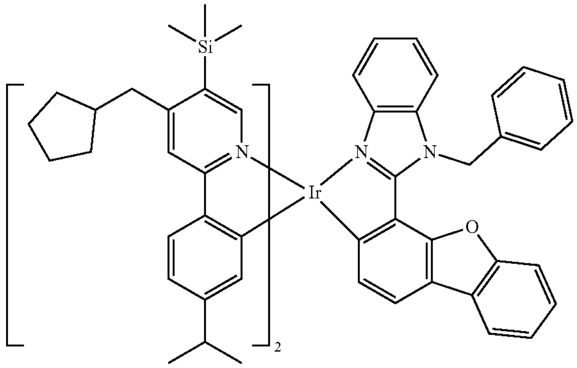
429
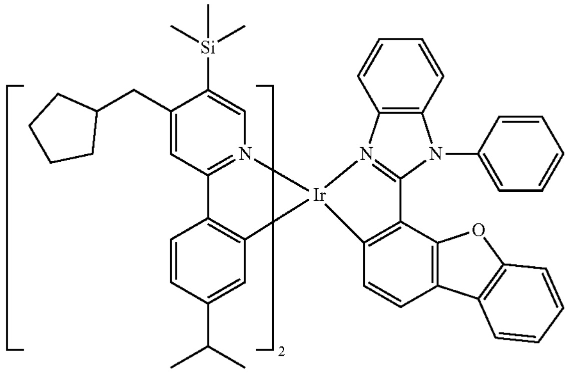
430
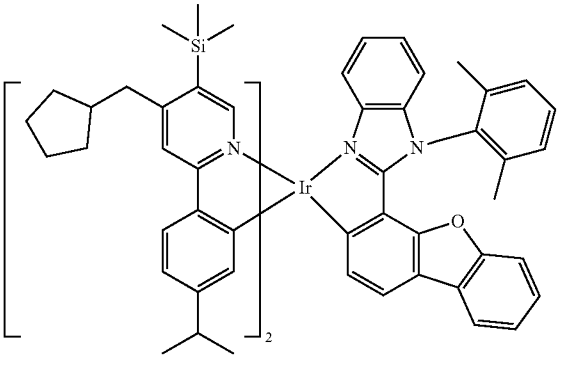
-continued
431
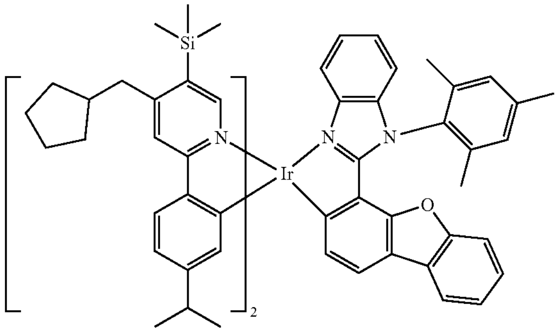
432
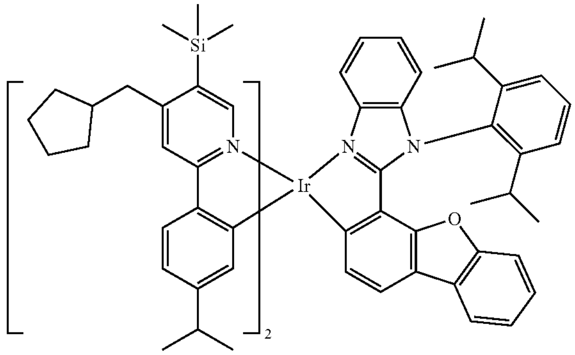
433
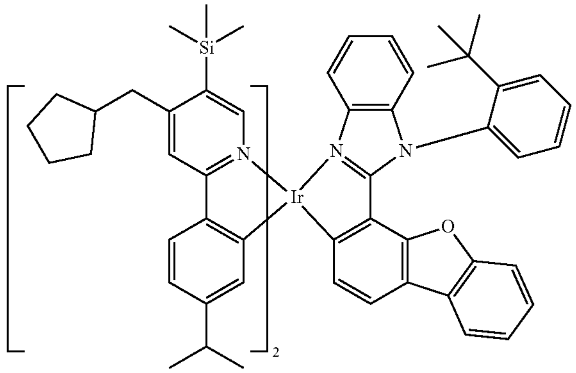
434
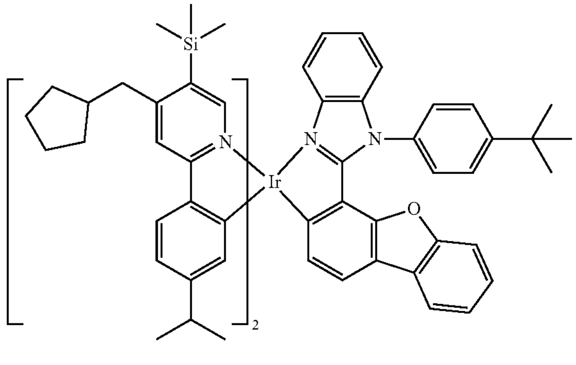

-continued
435
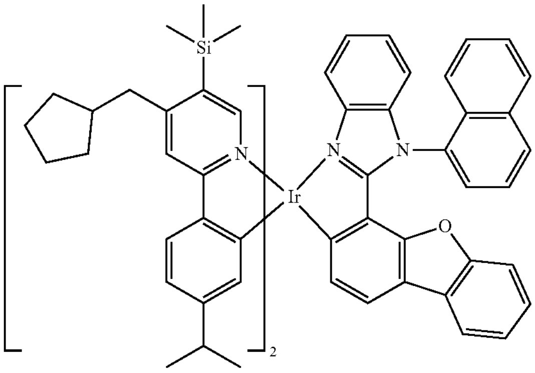
436
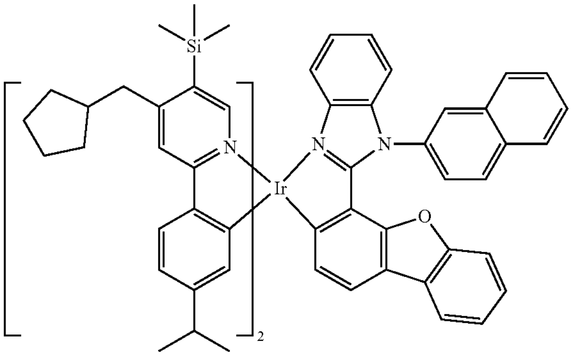
437
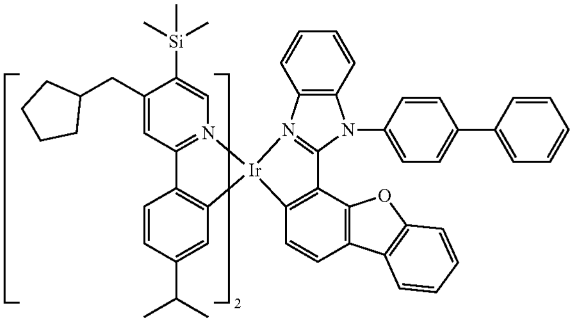
438
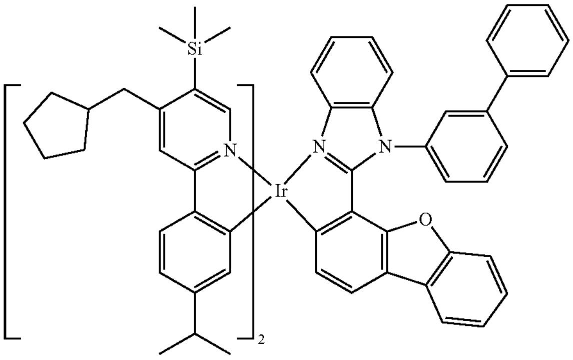
-continued
439
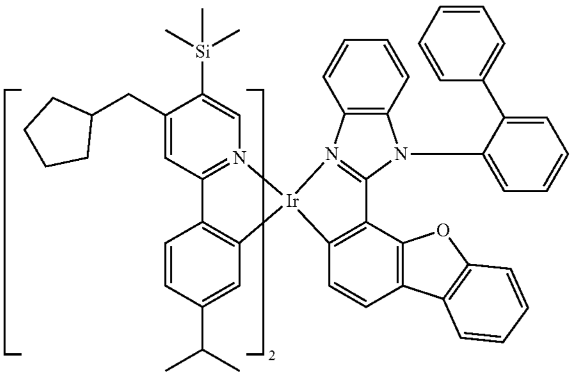
440
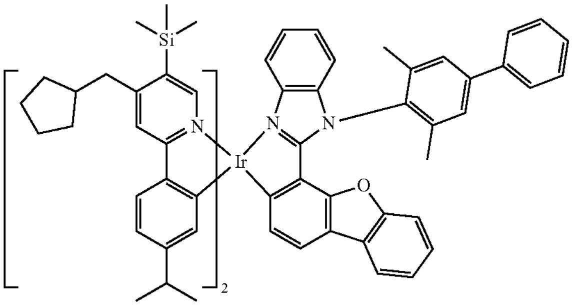
441
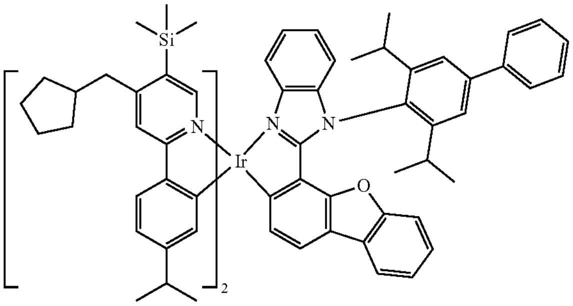
442
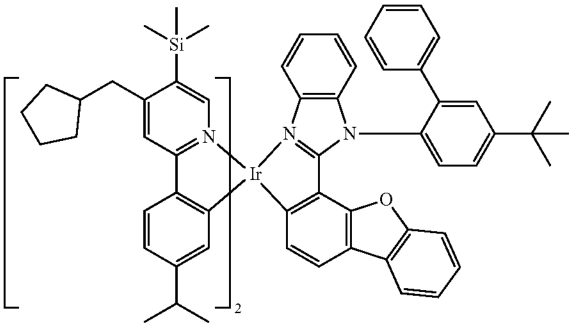

-continued
443
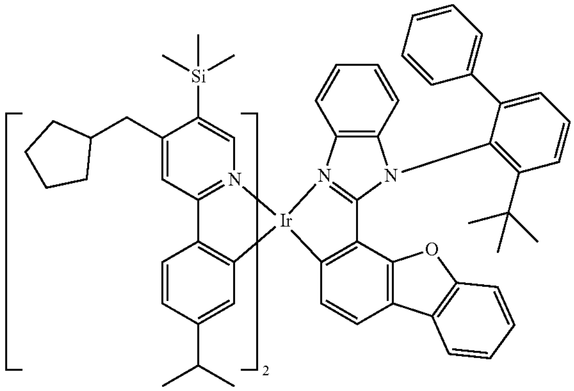
444
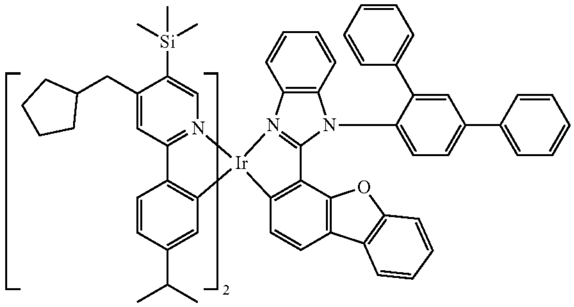
445
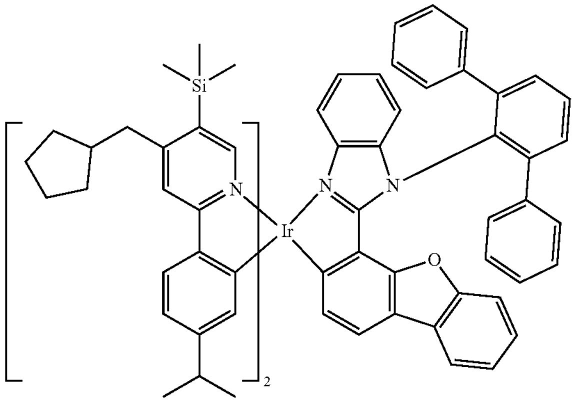
446
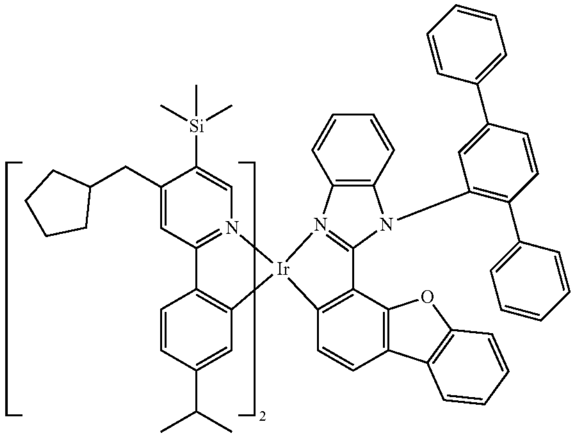
-continued
447
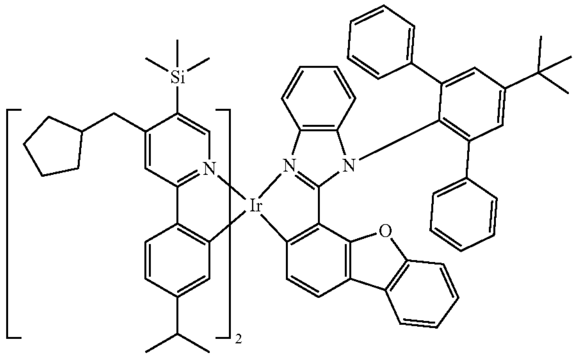
448
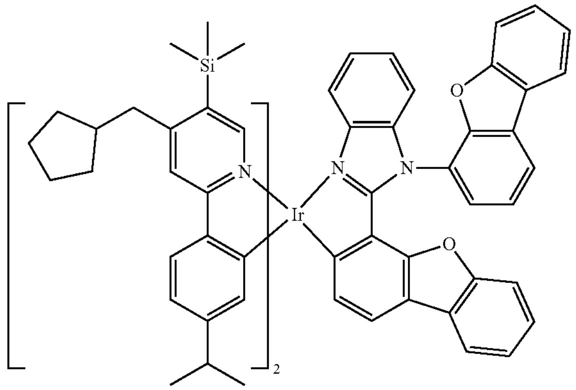
449
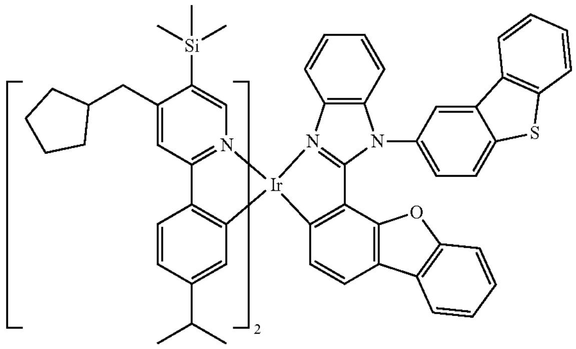
450
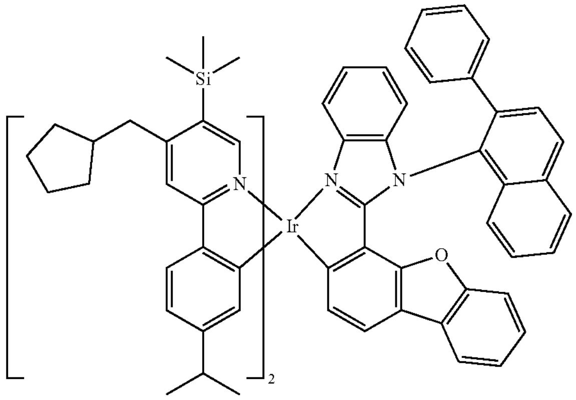

-continued
451
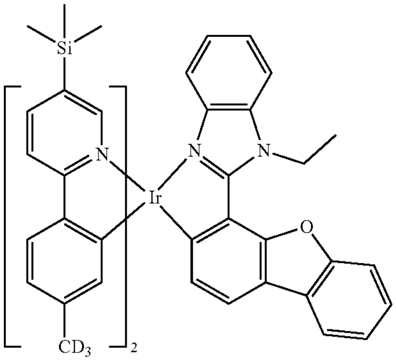
452
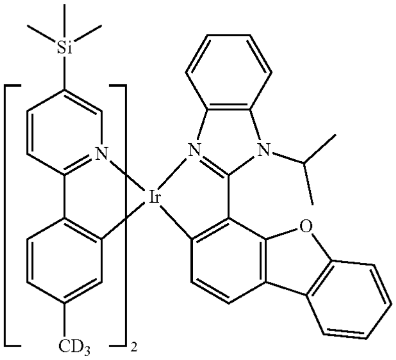
453
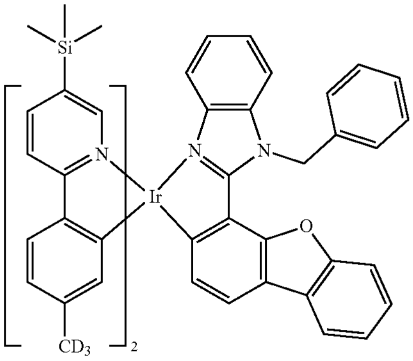
454
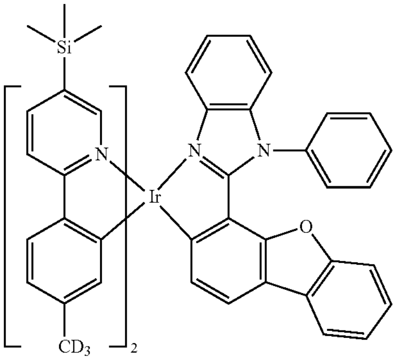
-continued
455
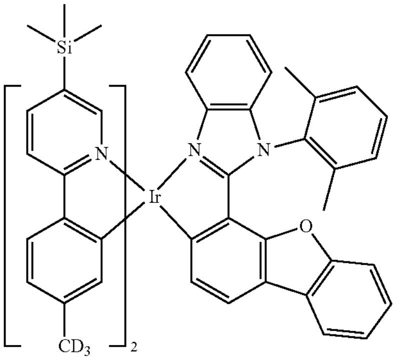
456
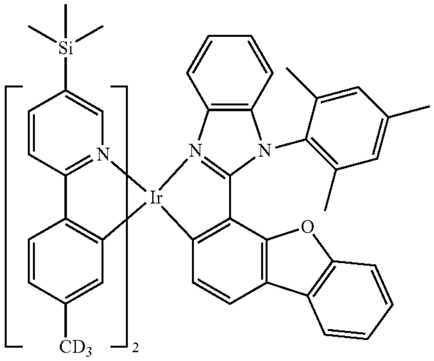
457
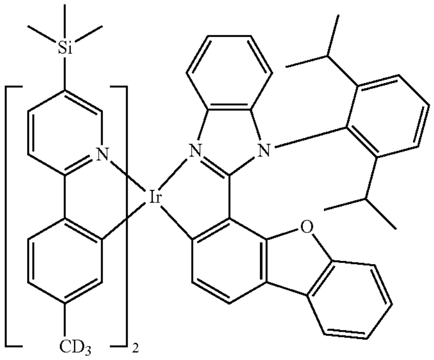
458
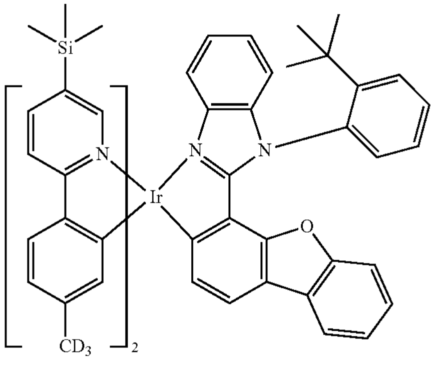

-continued
459
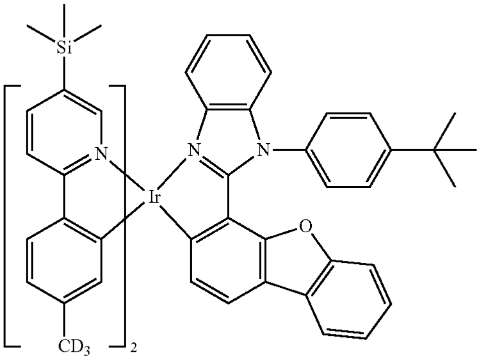
460
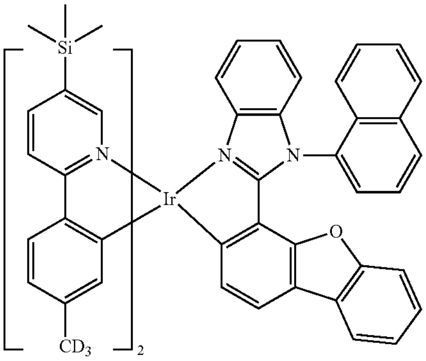
461
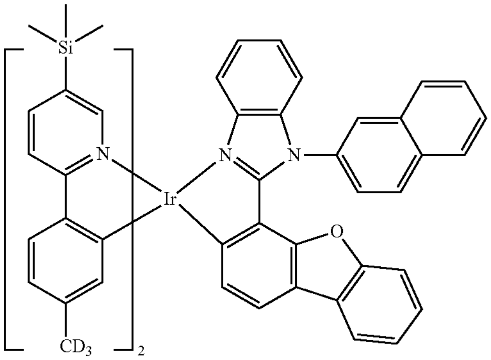
462
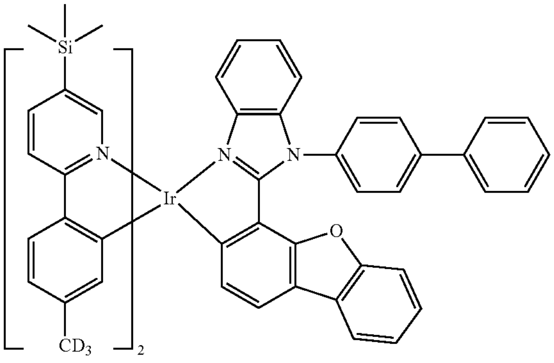
-continued
463
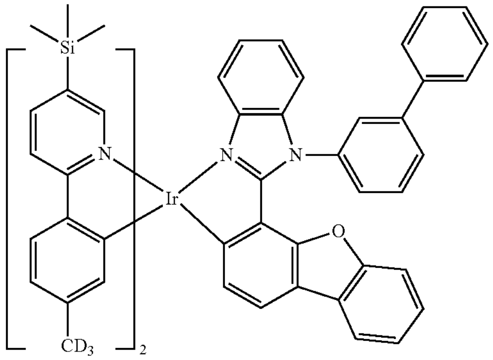
464
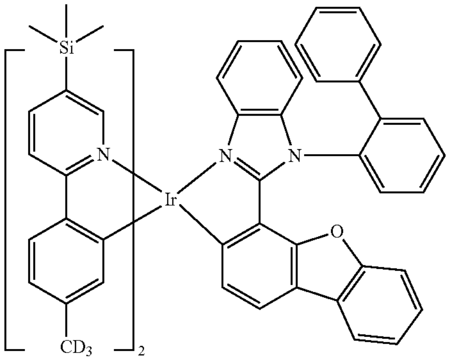
465
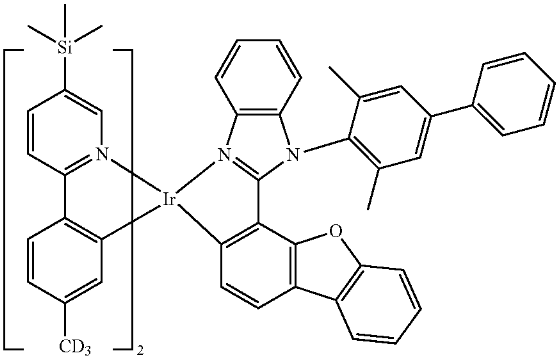
466
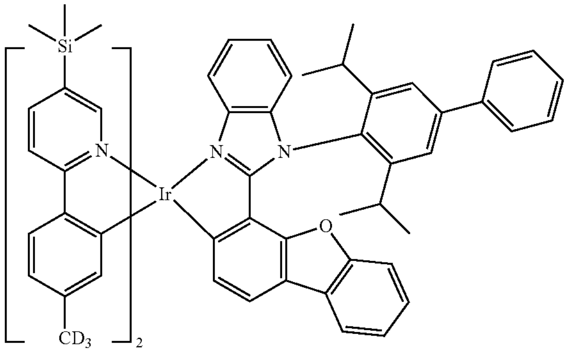

467
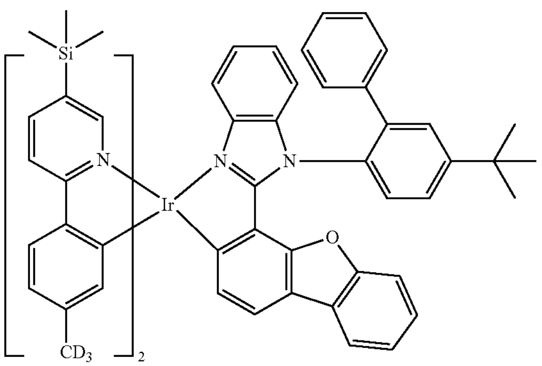
468
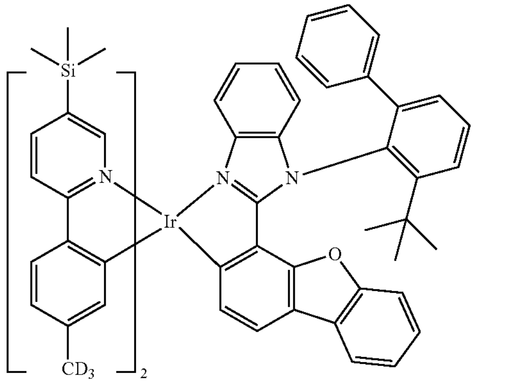
469
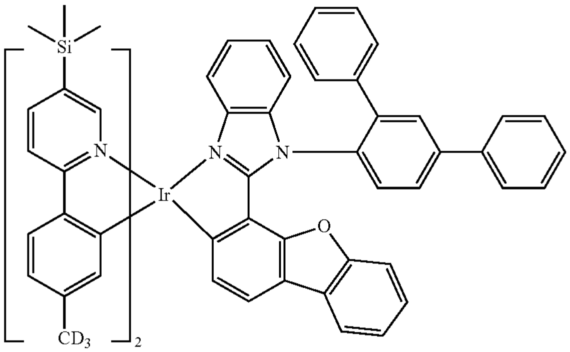
470
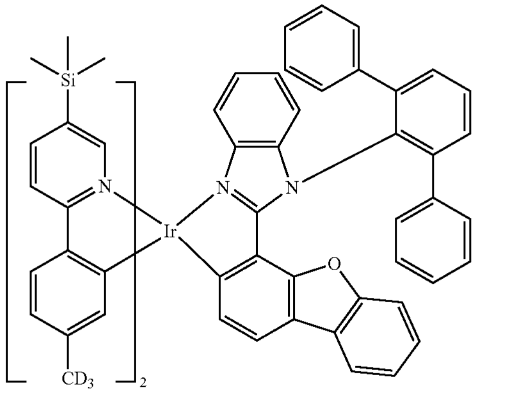
471
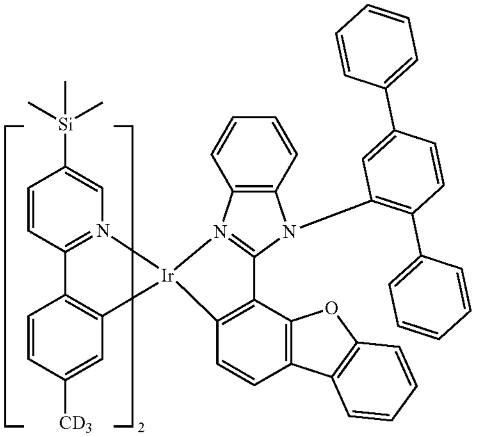
472
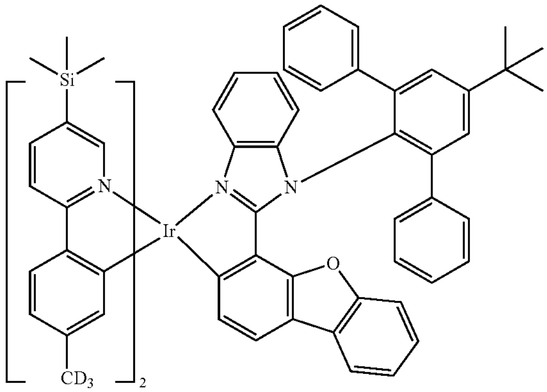
473
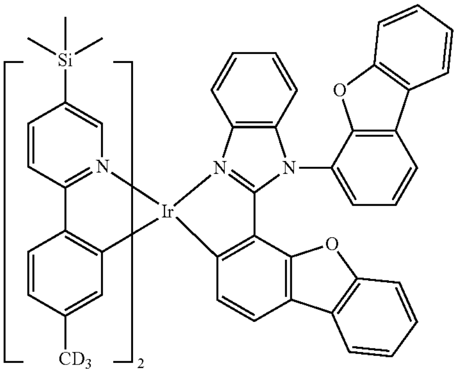
474
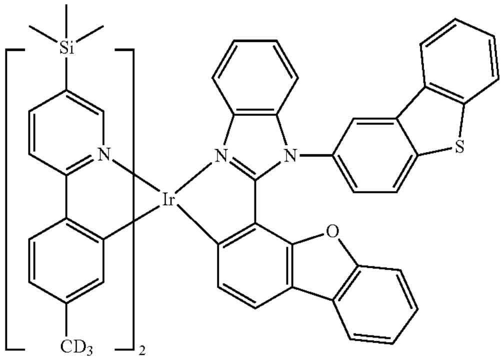

-continued
475
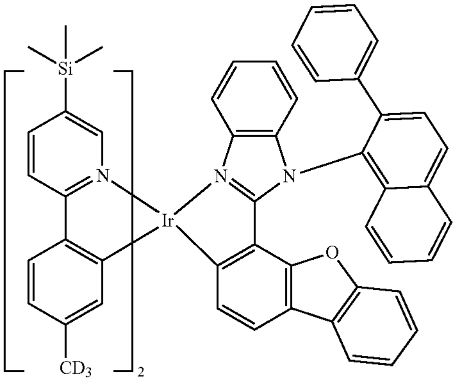
476
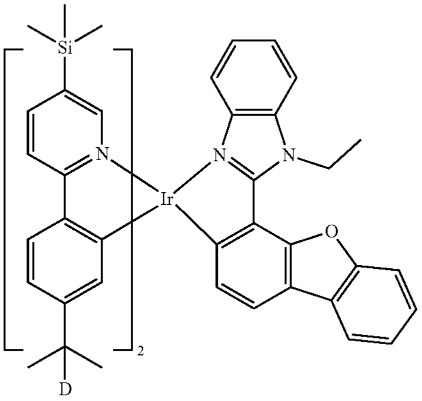
477
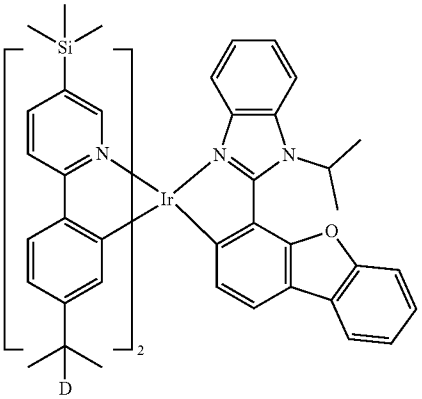
478
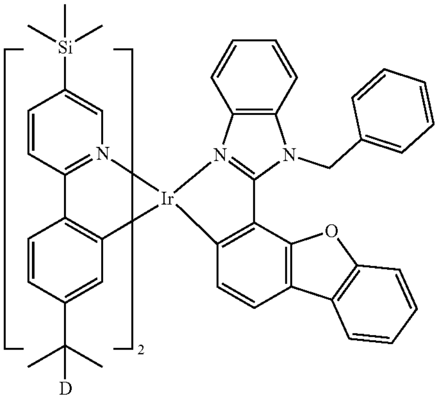
-continued
479
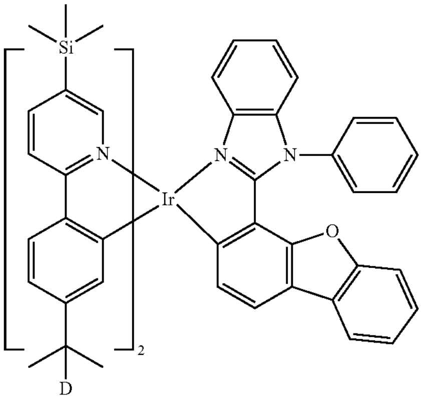
480
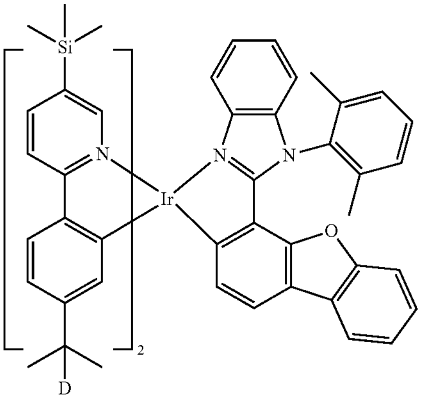
481
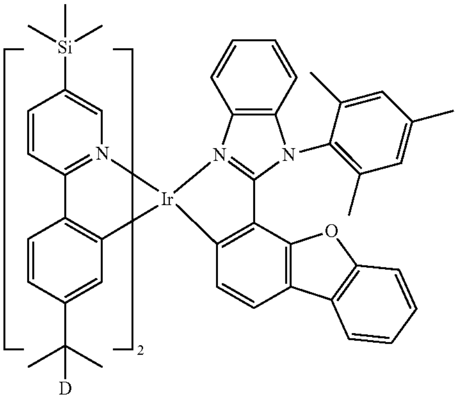
482
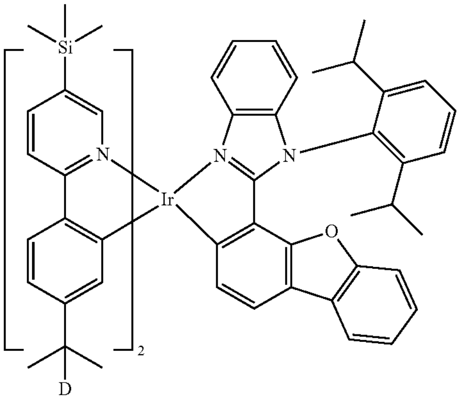

-continued
483
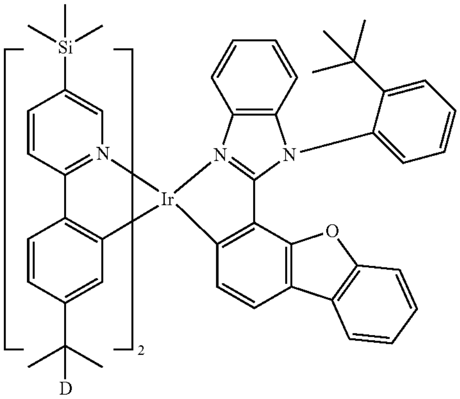
484
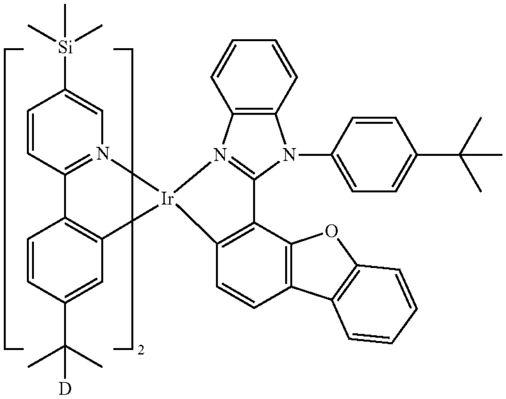
485
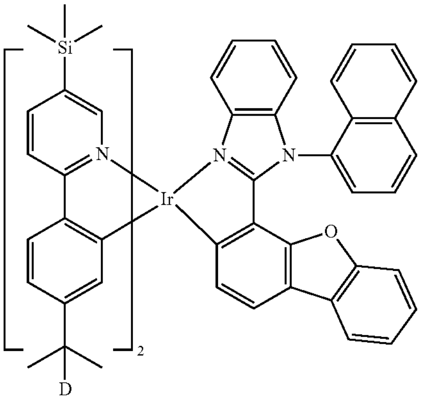
486
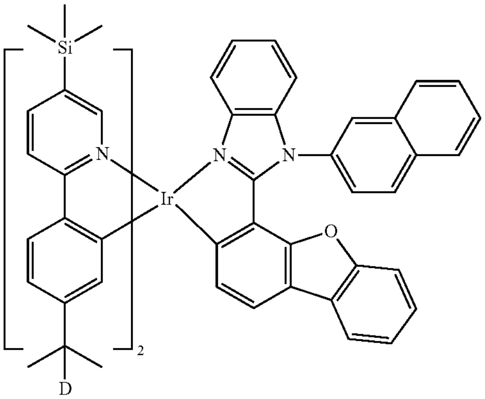
-continued
487
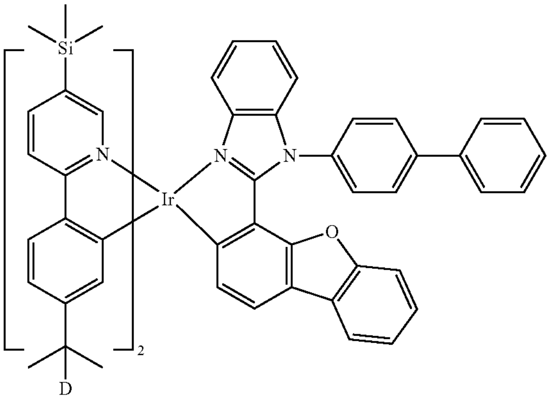
488
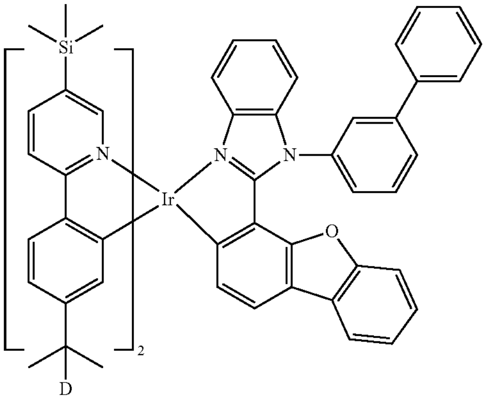
489
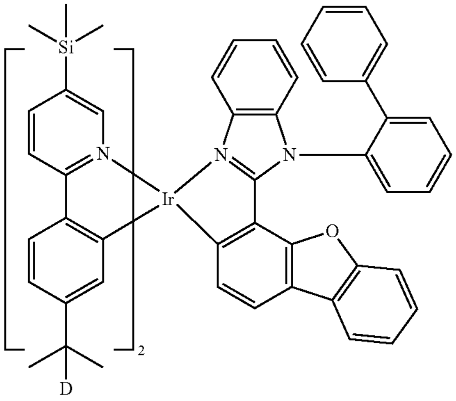
490
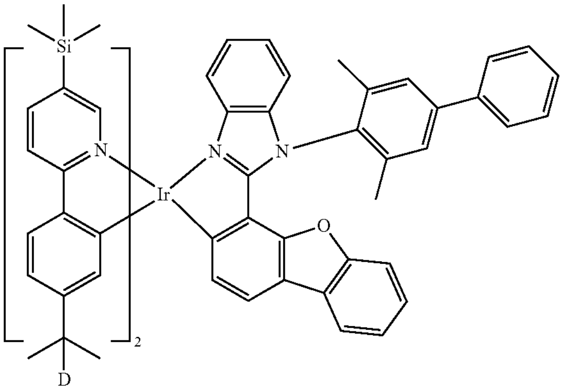

-continued
491
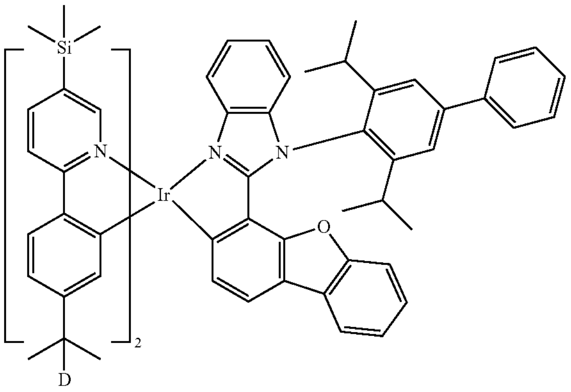
492
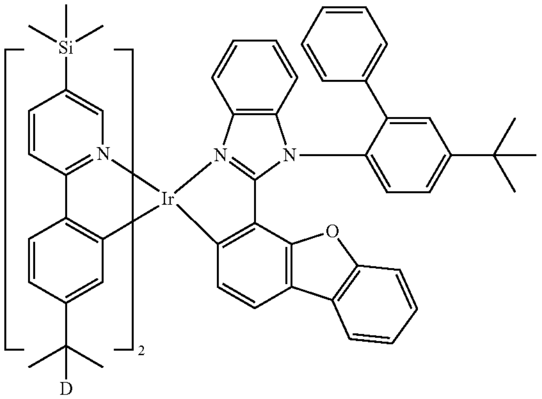
493
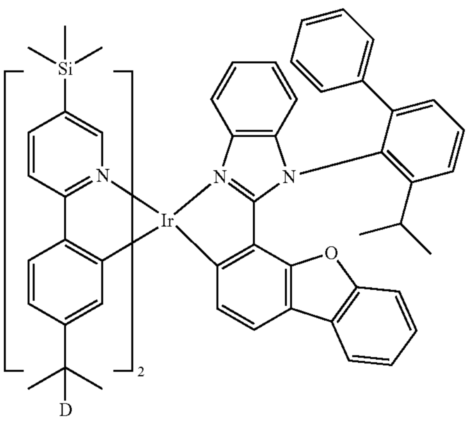
-continued
494
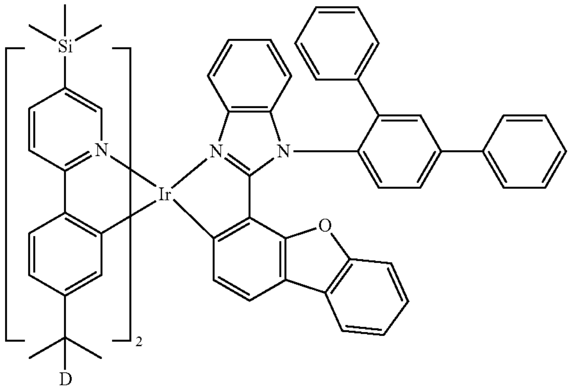
495
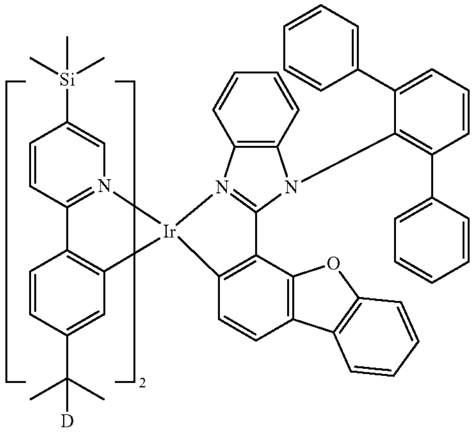
496
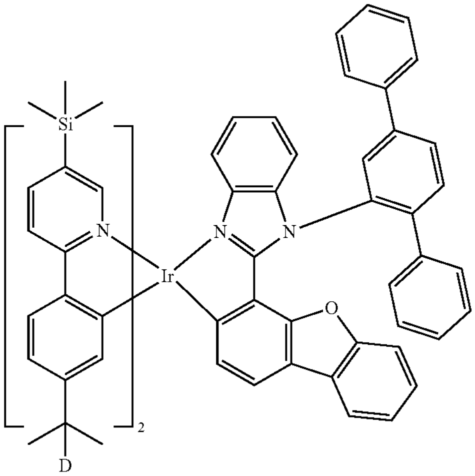

-continued
497
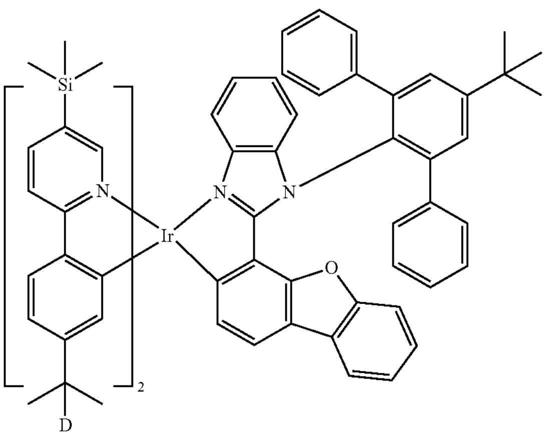
498
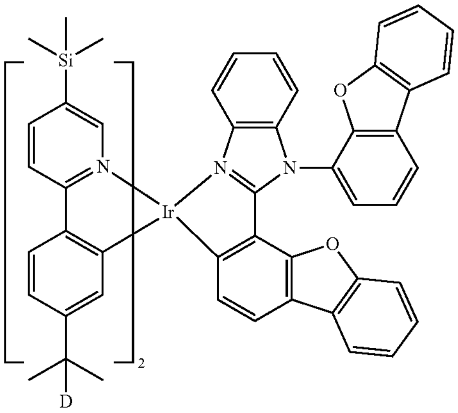
499
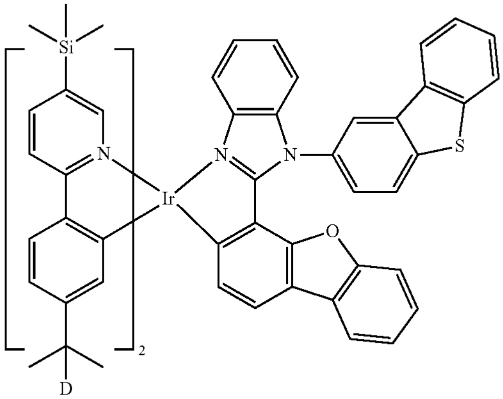
-continued
500
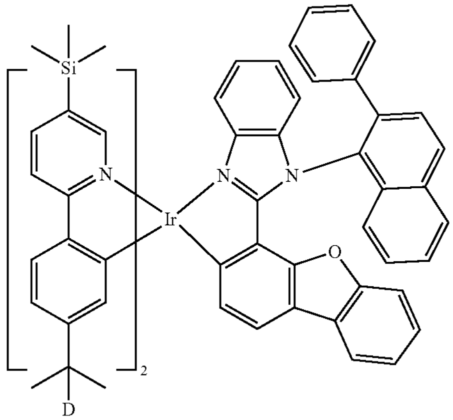
501
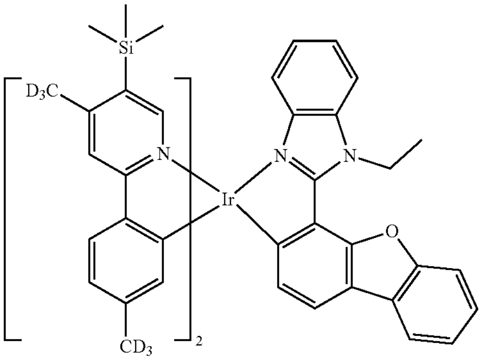
502
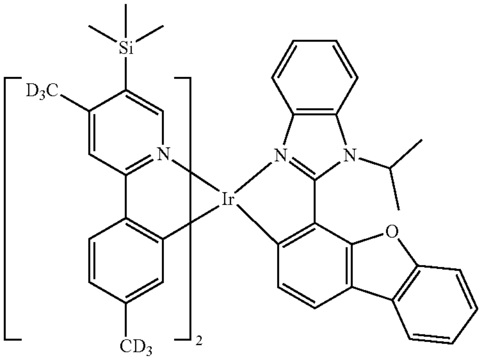
503
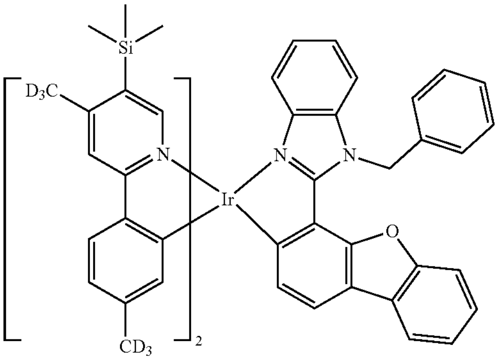

-continued
504
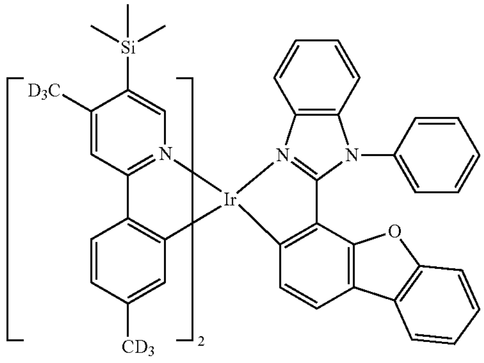
505
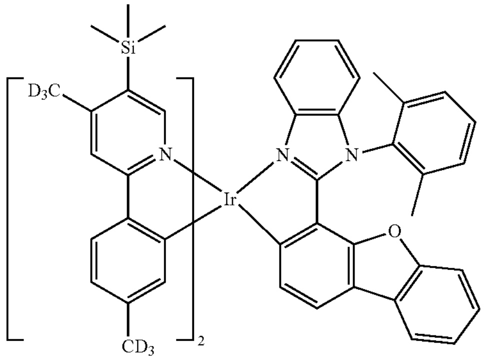
506
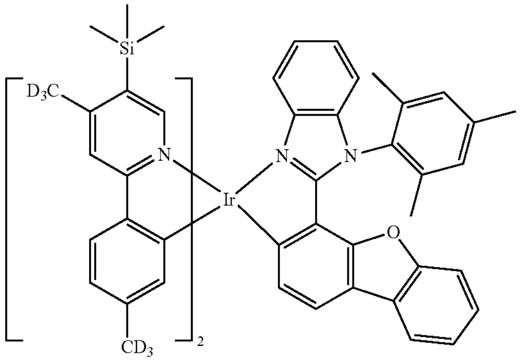
507
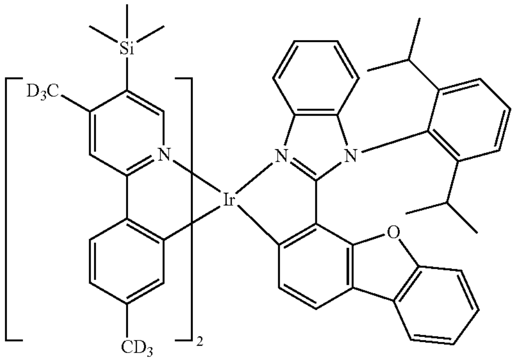
-continued
508
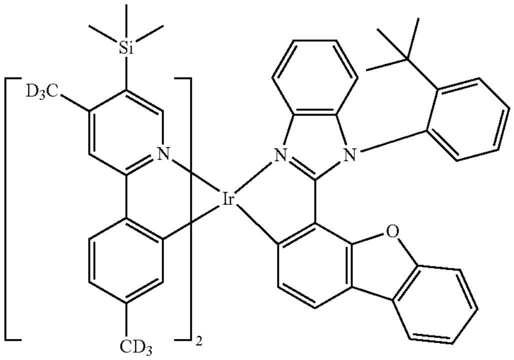
509
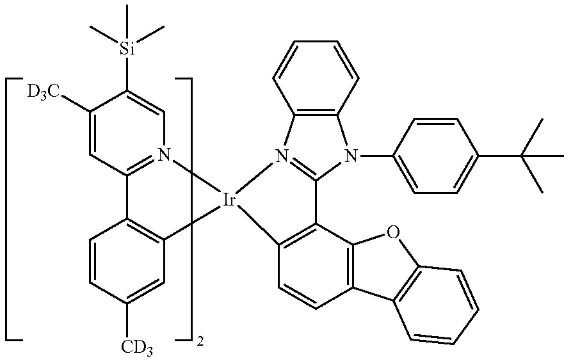
510
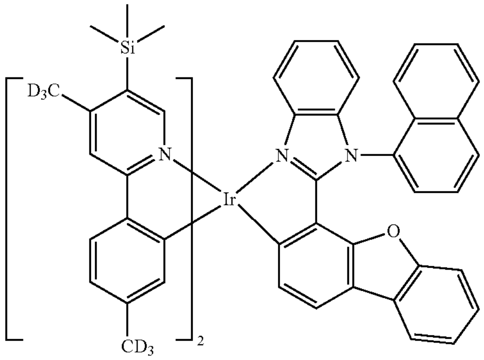
511
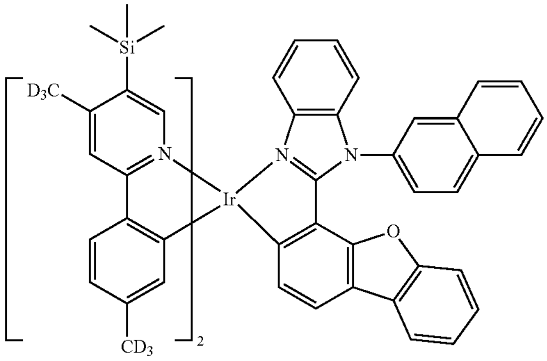

-continued
512
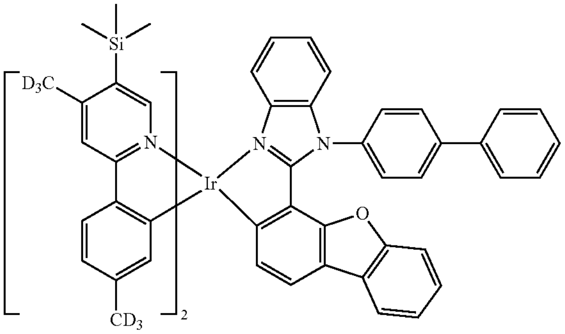
513
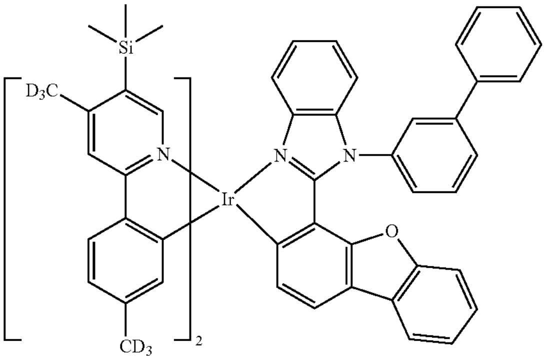
514
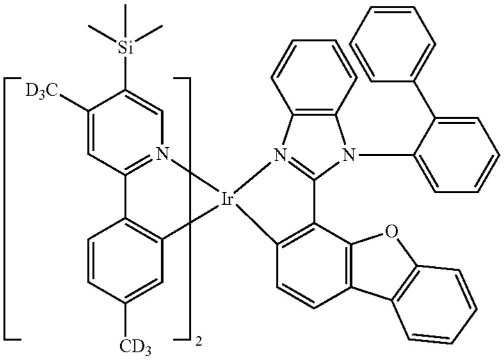
515
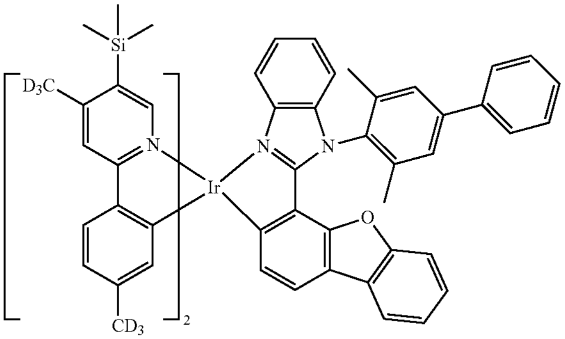
-continued
516
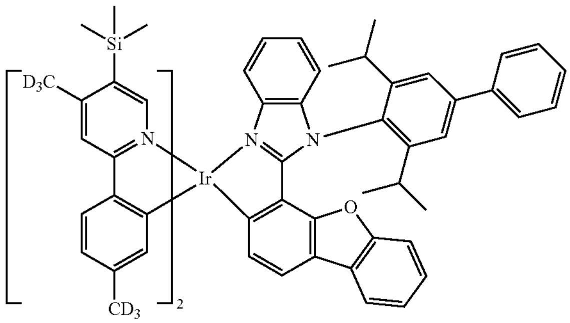
517
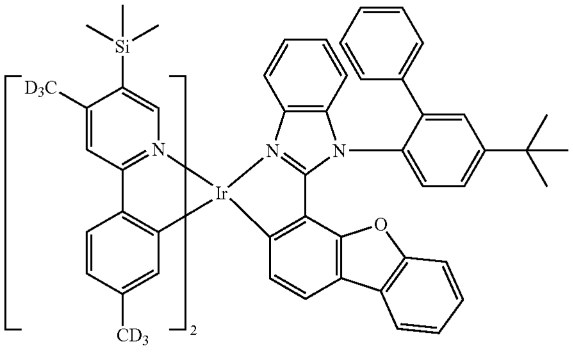
518
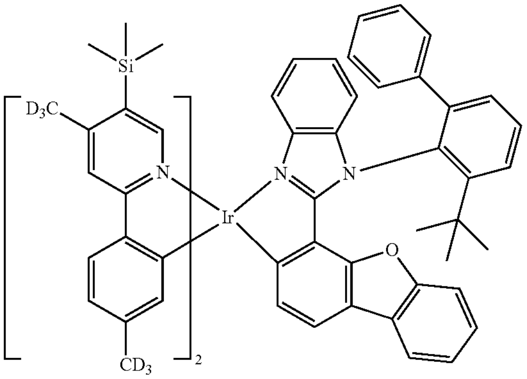
519
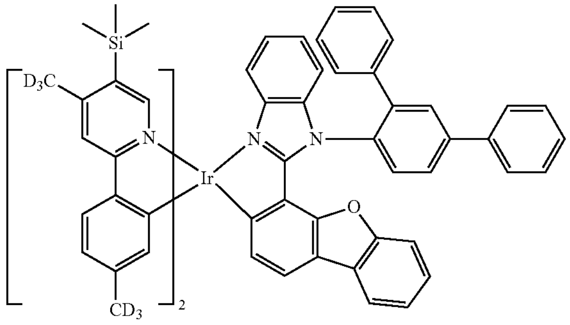

-continued
520
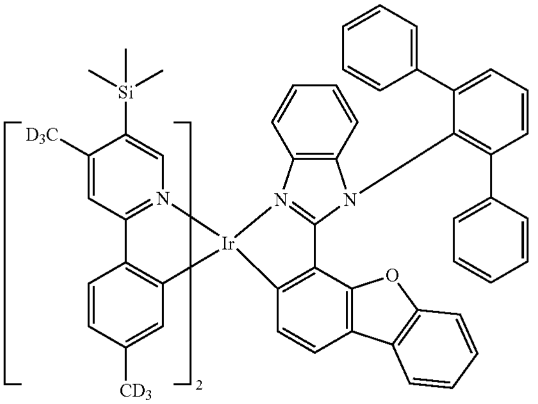
521
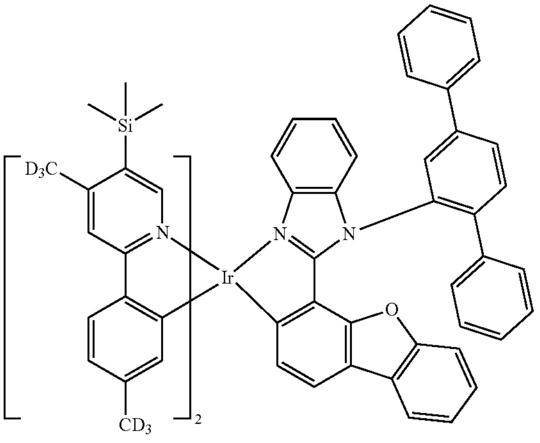
522
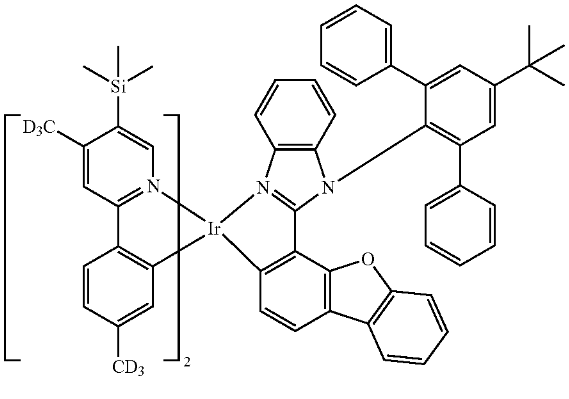
-continued
523
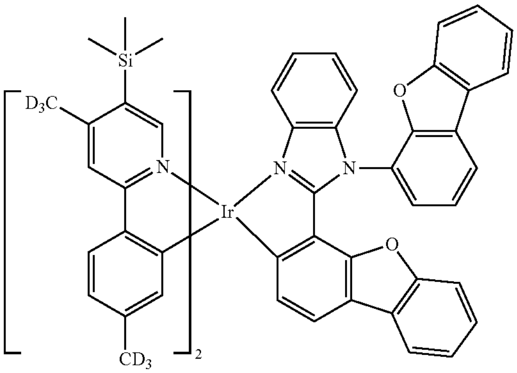
524
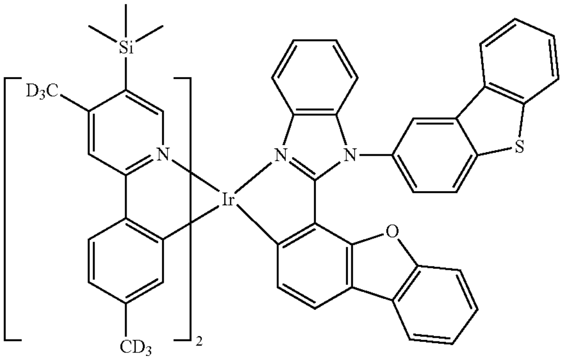
525
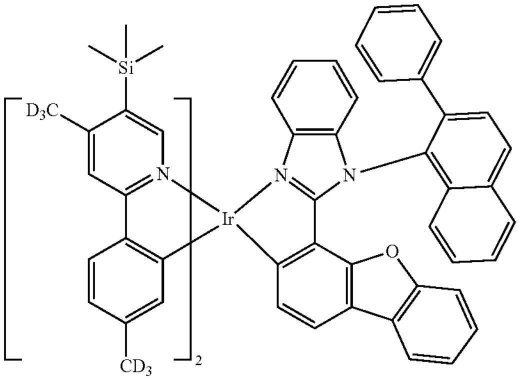
526
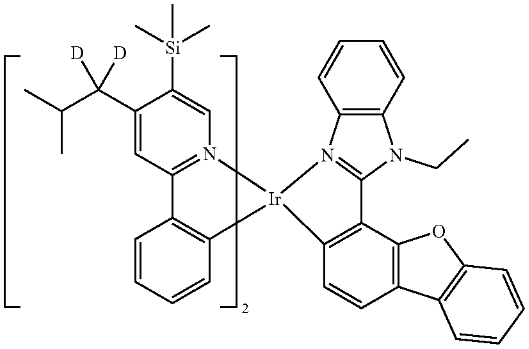

-continued
527
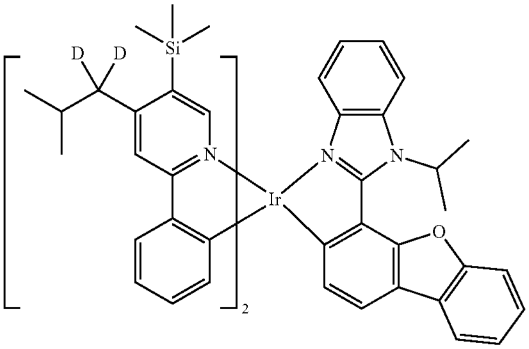
528
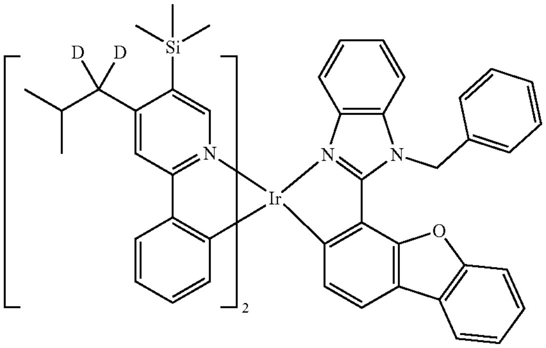
529
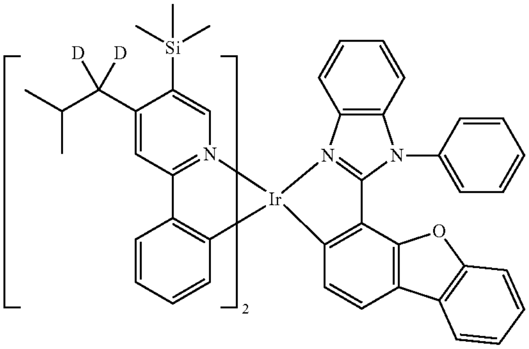
530
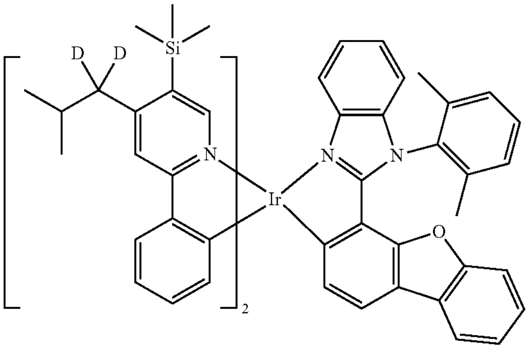
-continued
531
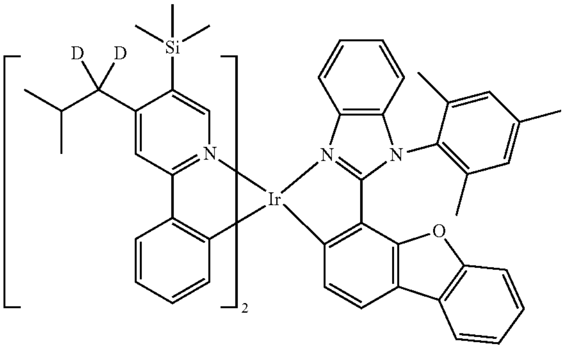
532
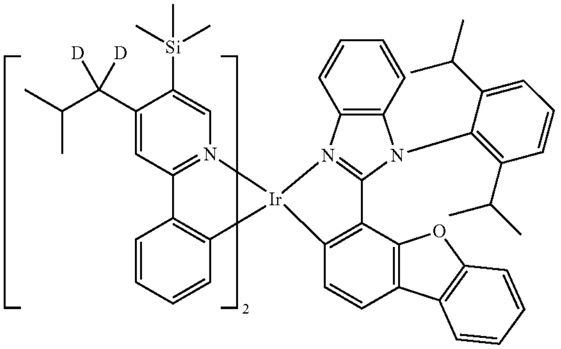
533
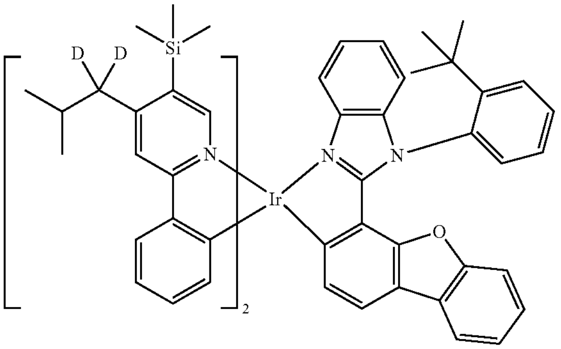
534
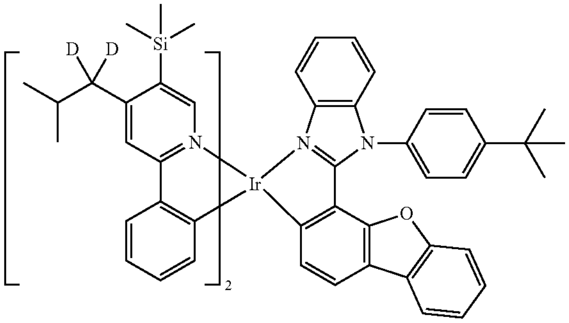

-continued
535
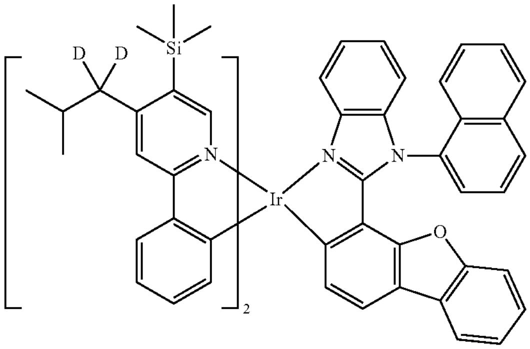
536
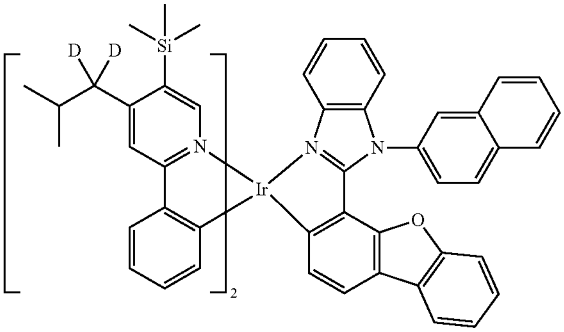
537
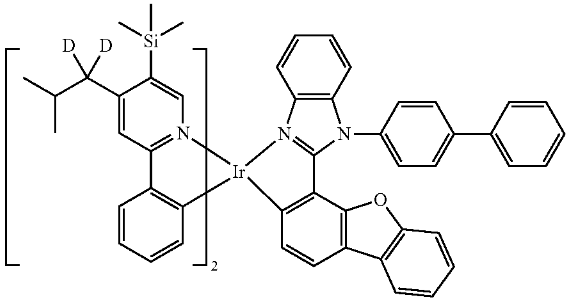
538
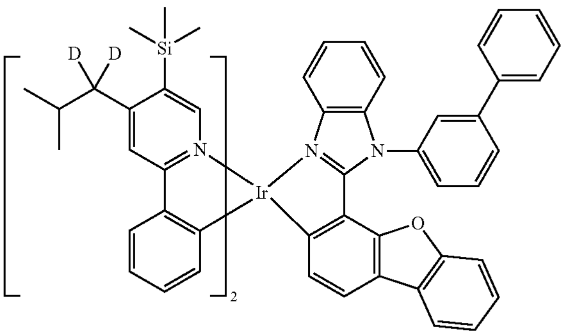
-continued
539
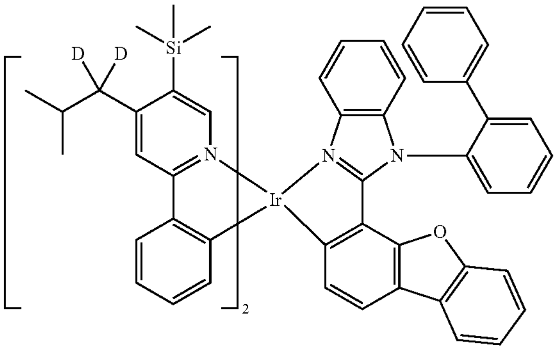
540
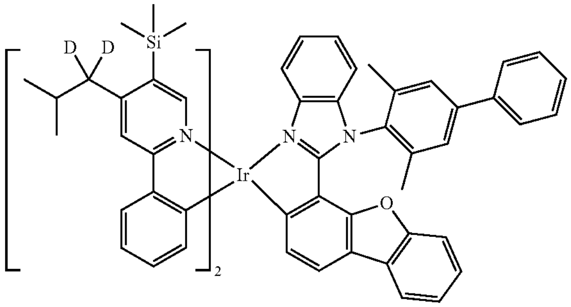
541
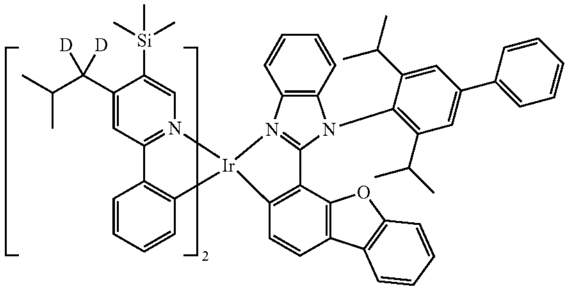
542
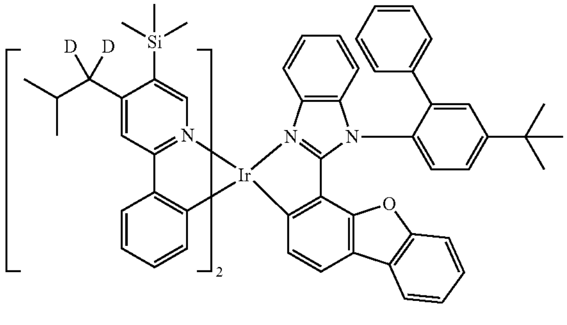

-continued
543
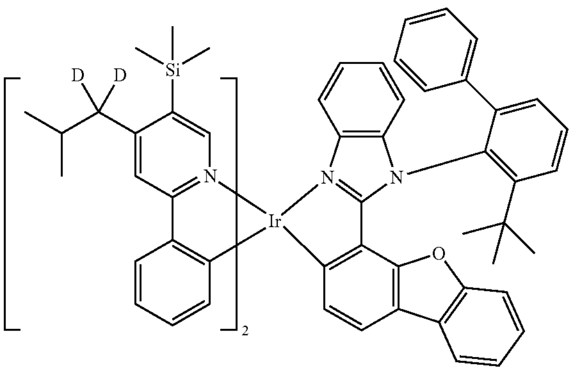
544
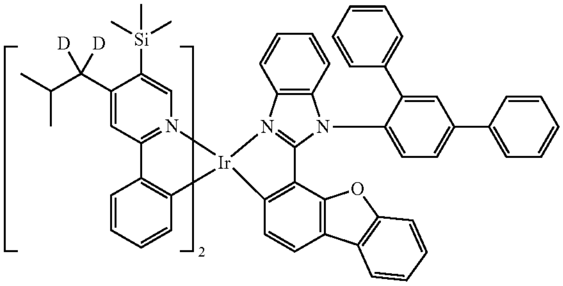
545
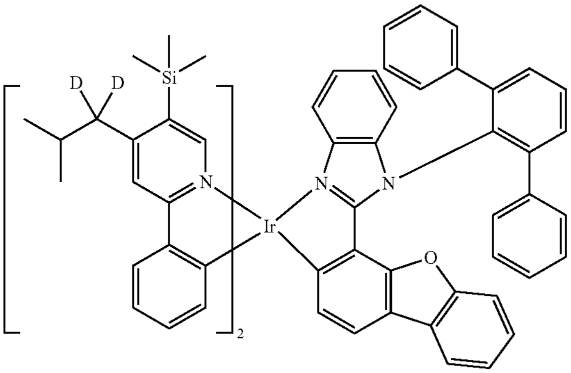
546
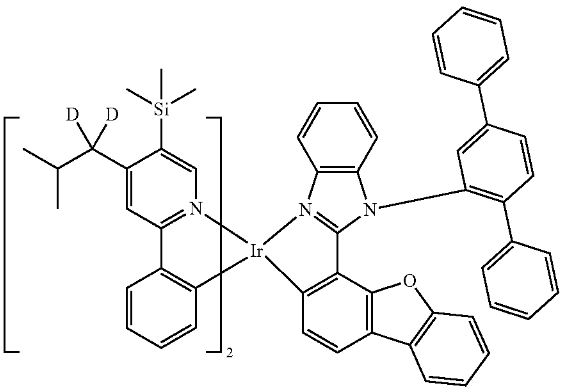
547
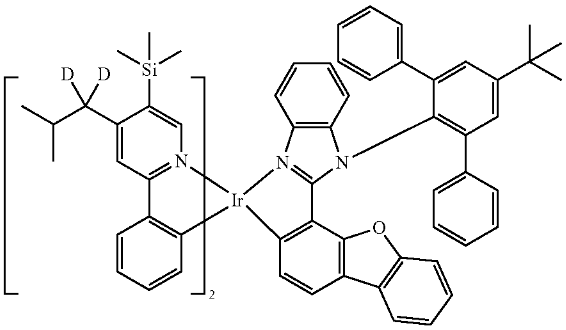
548
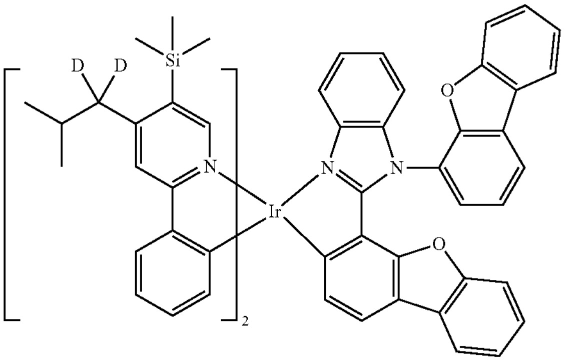
549
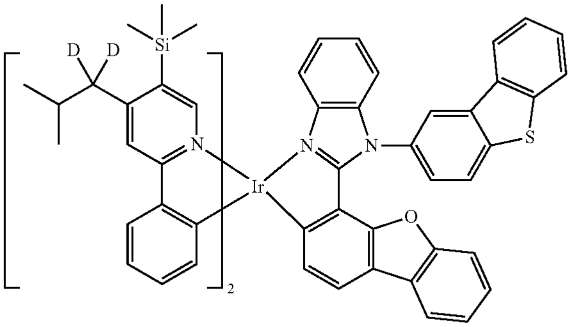
550
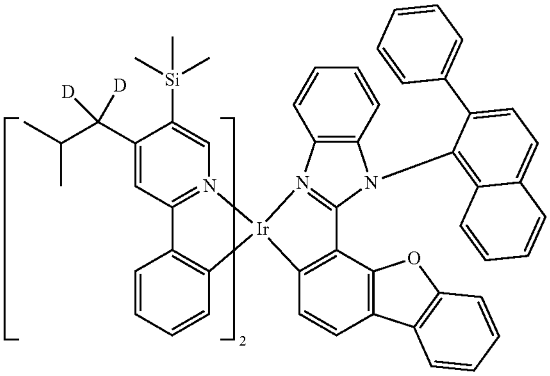

-continued
551
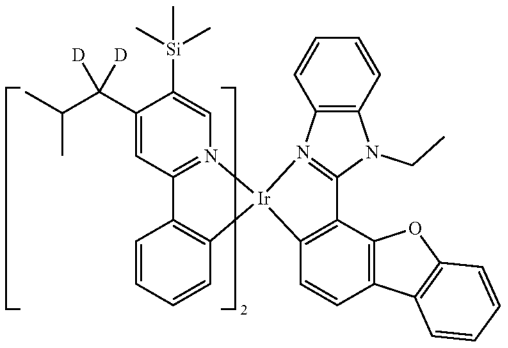
552
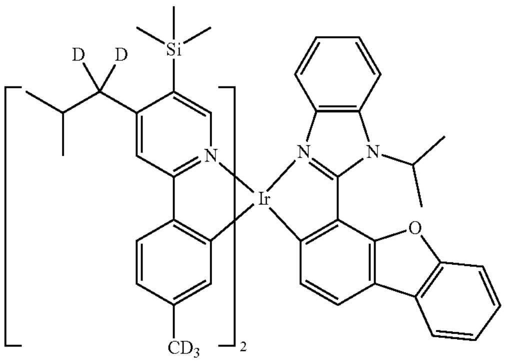
553
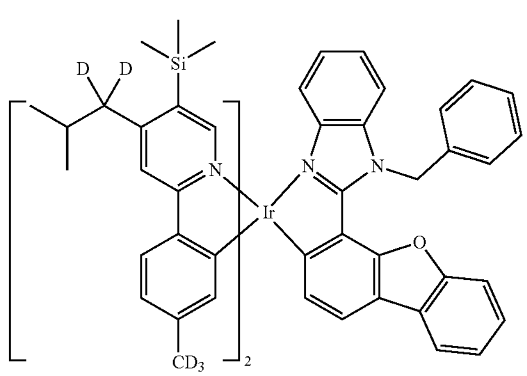
554
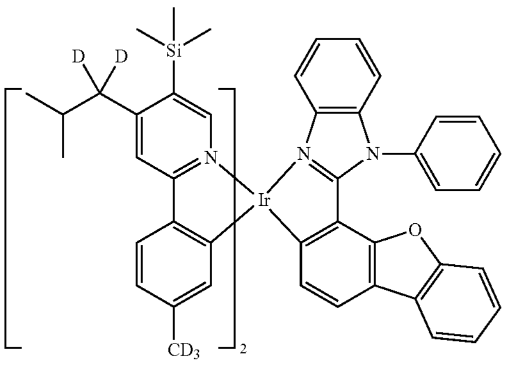
-continued
555
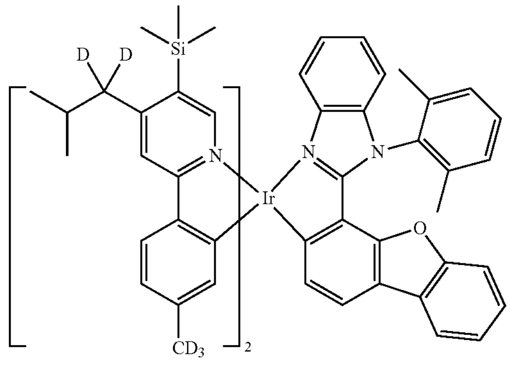
556
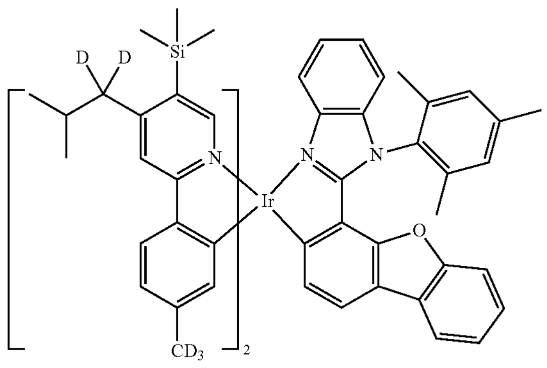
557
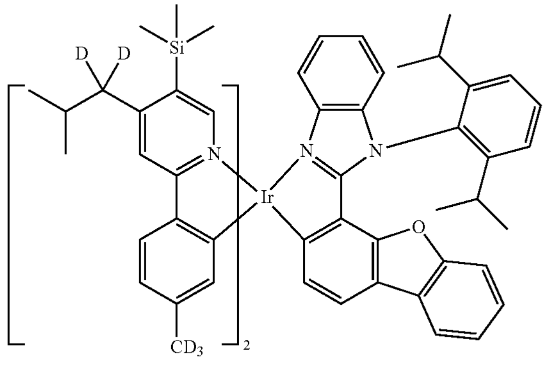
558
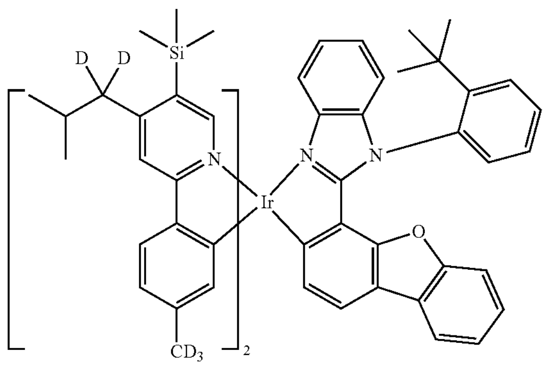

-continued
559
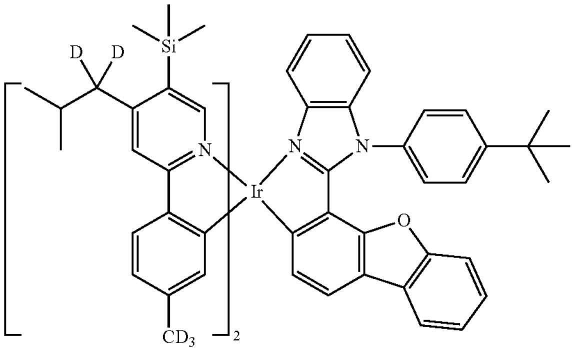
560
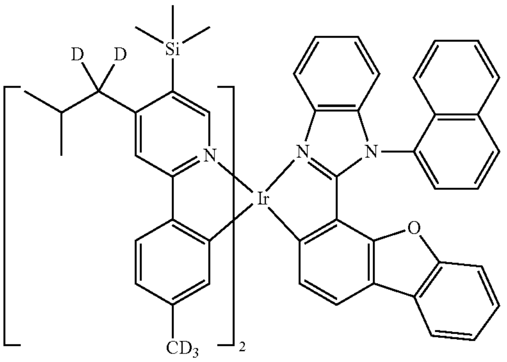
561
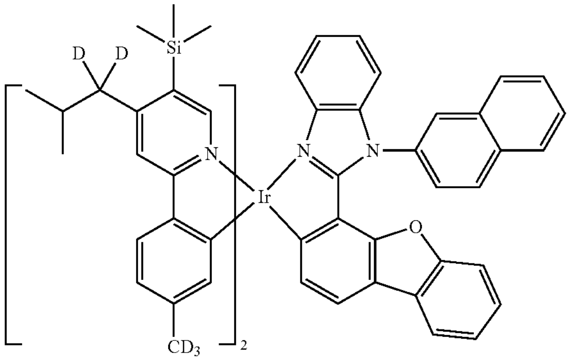
562
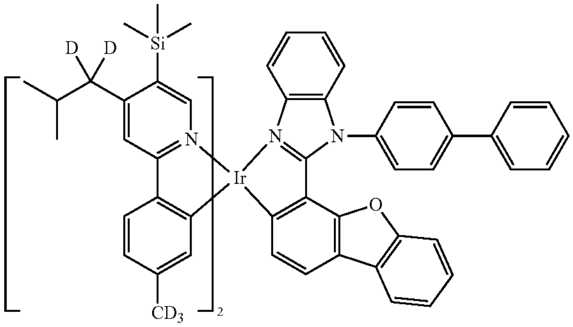
-continued
563
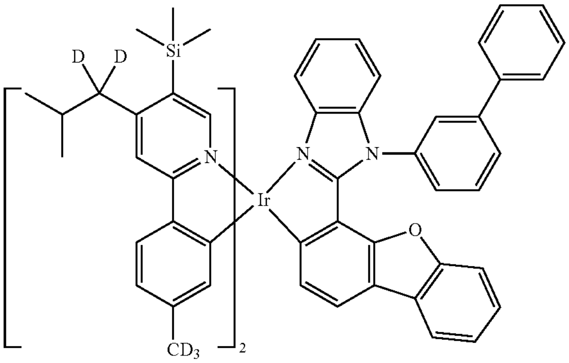
564
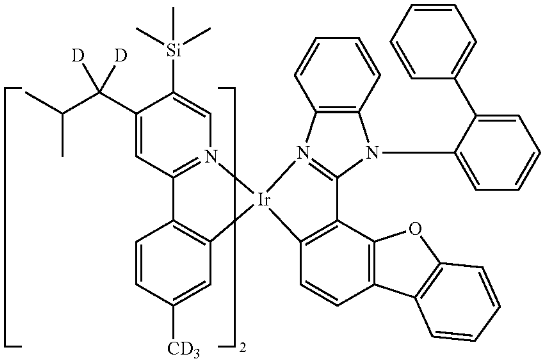
565
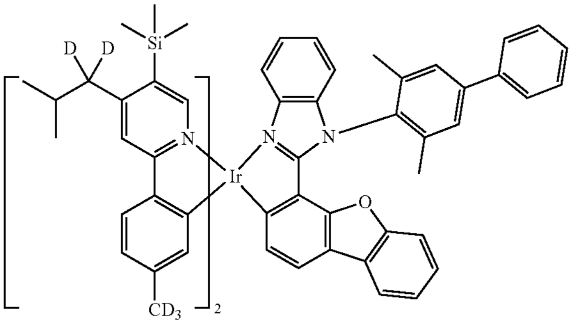
566
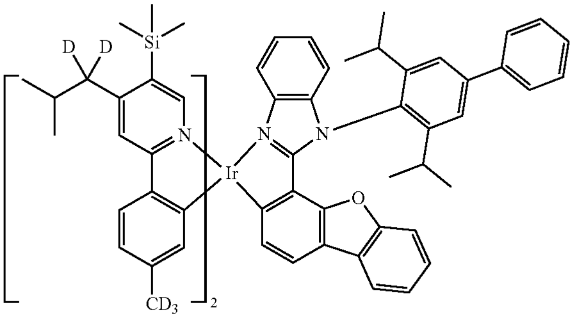

567
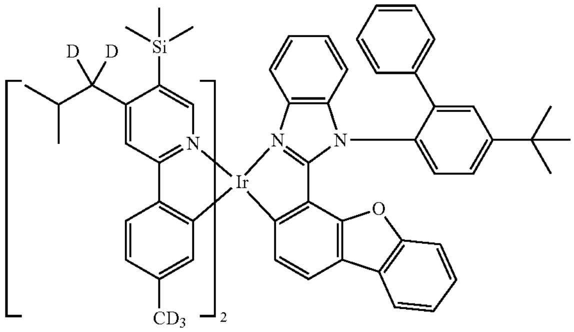
568
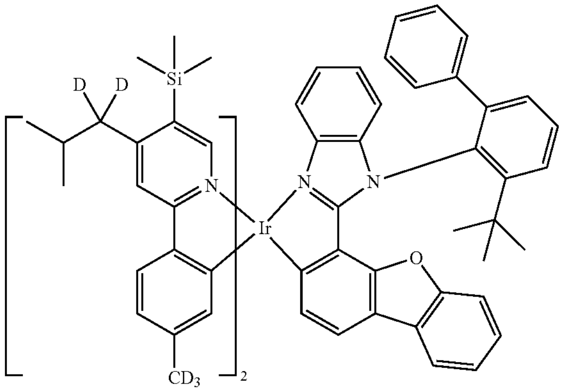
569
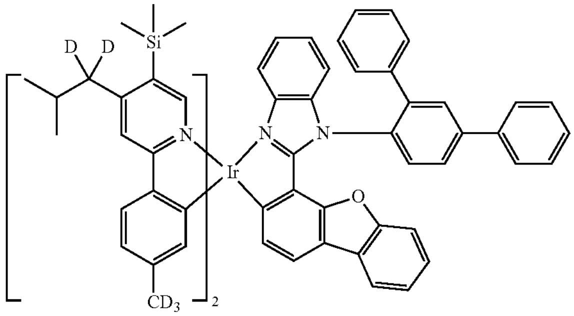
570
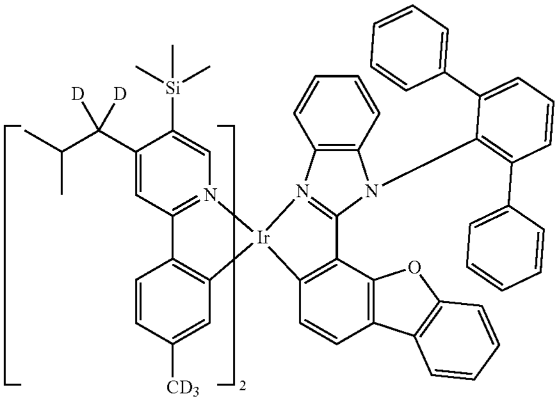
571
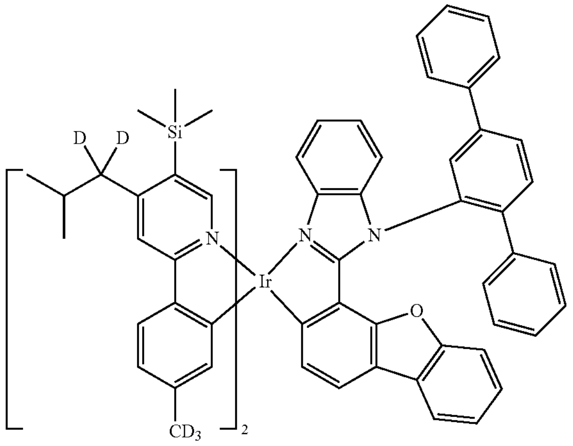
572
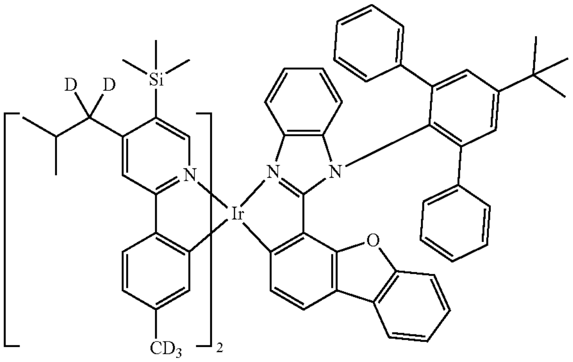
573
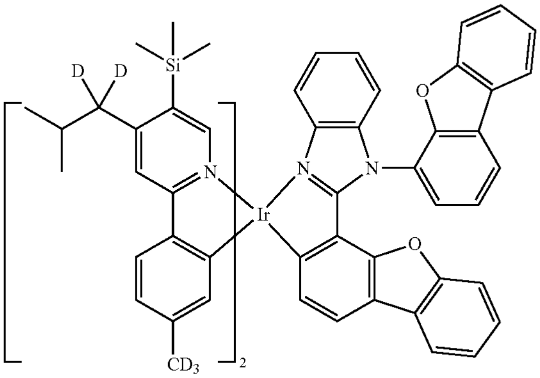
574
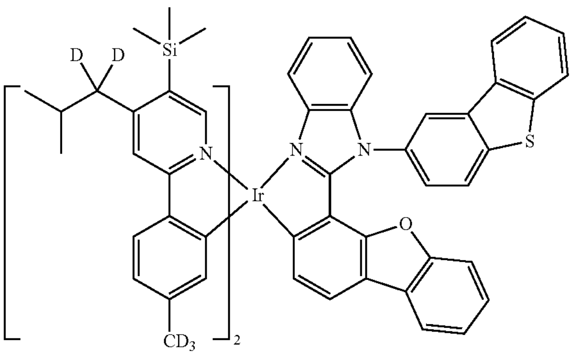

-continued
575
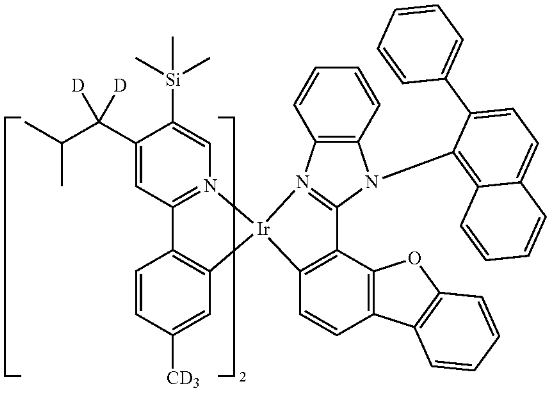
576
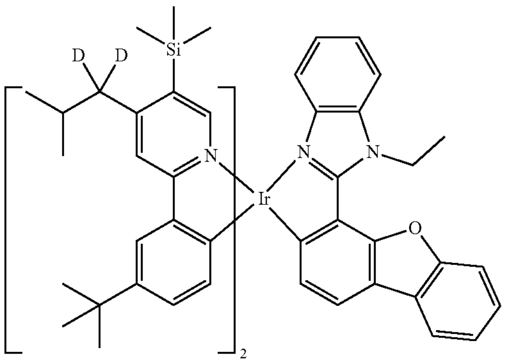
577
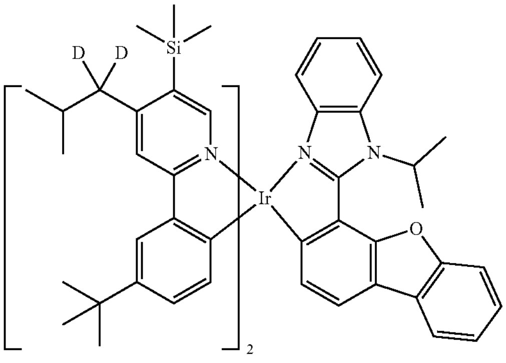
578
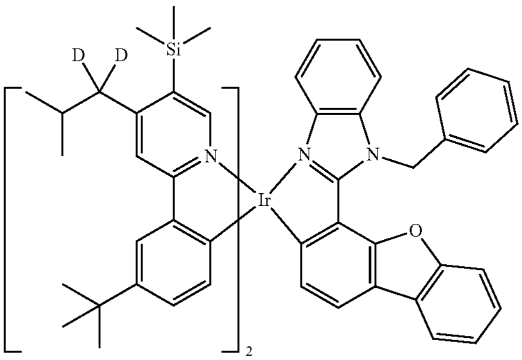
-continued
579
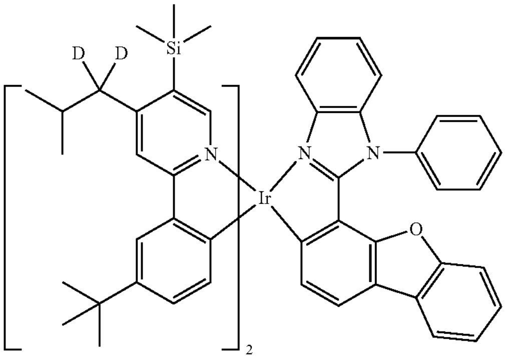
580
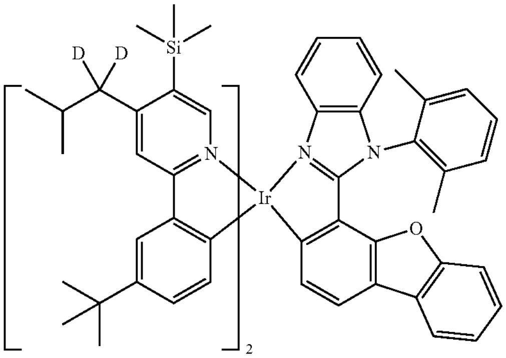
581
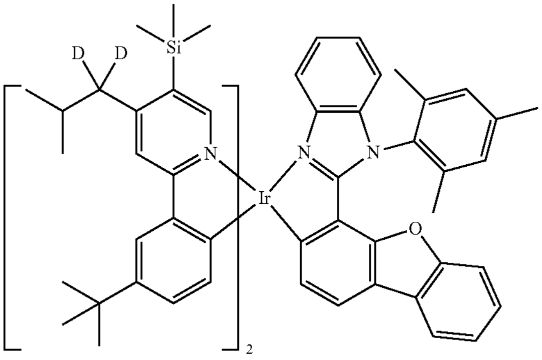
582
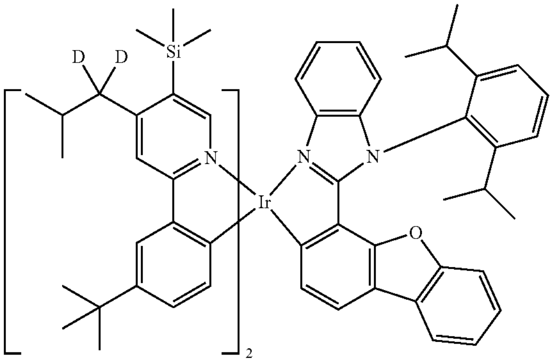

-continued
583
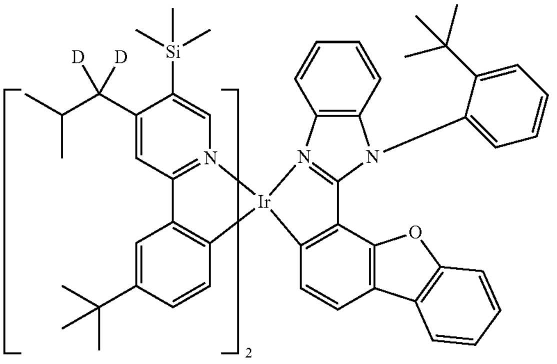
584
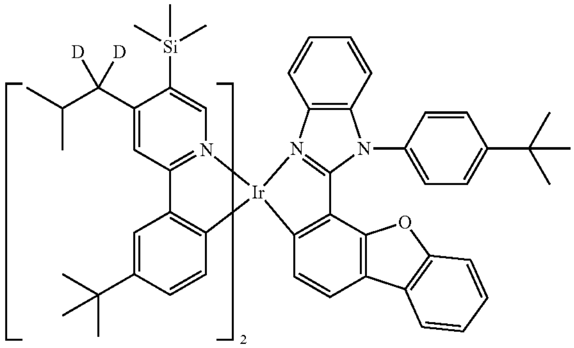
585
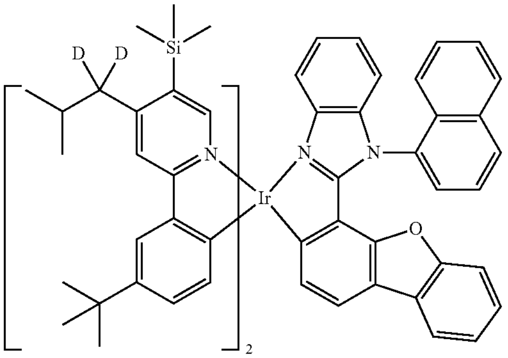
586
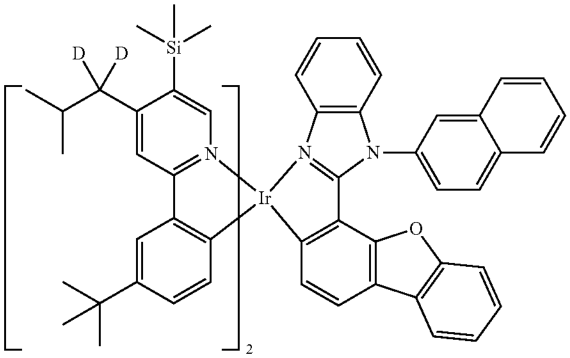
-continued
587
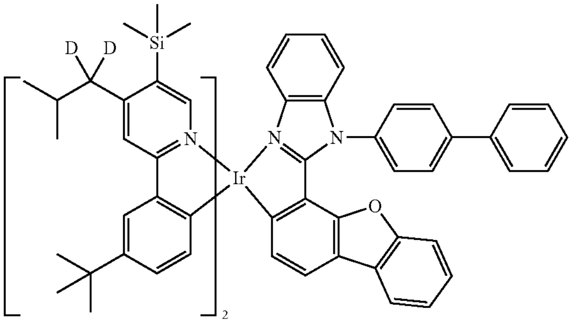
588
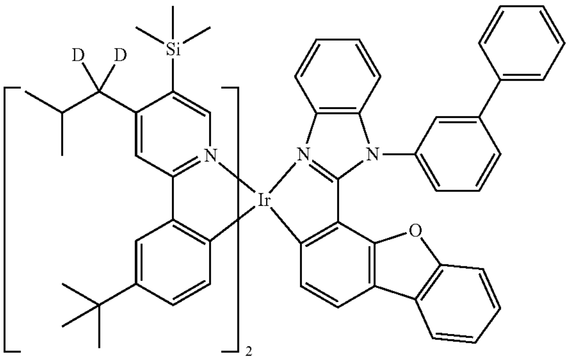
589
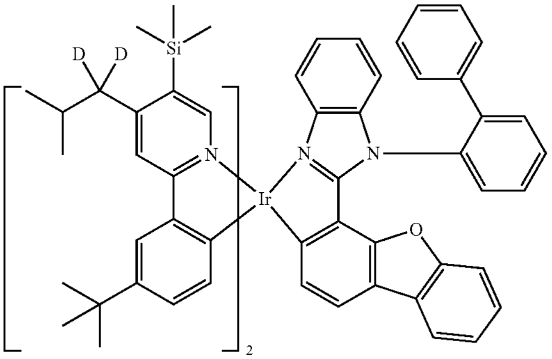
590
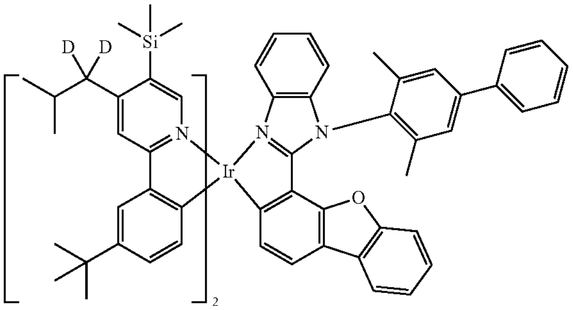

-continued
591
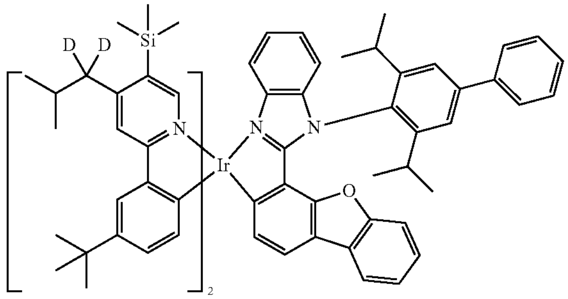
592
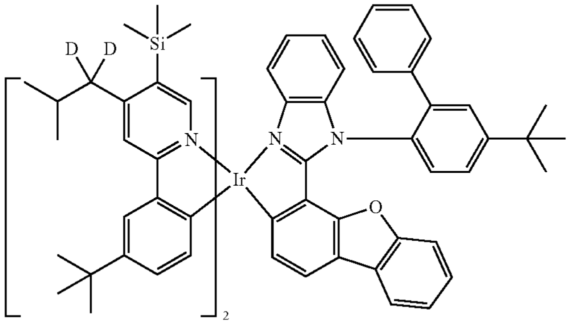
593
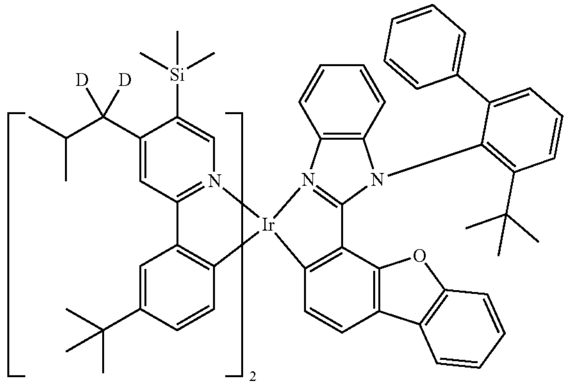
594
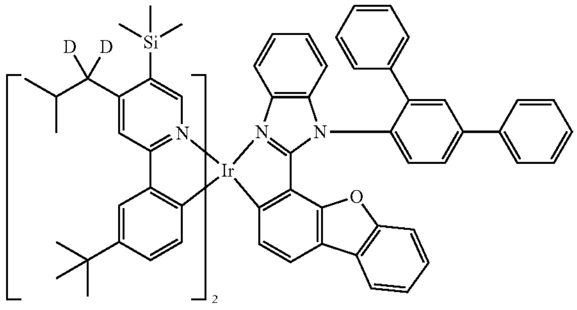
-continued
595
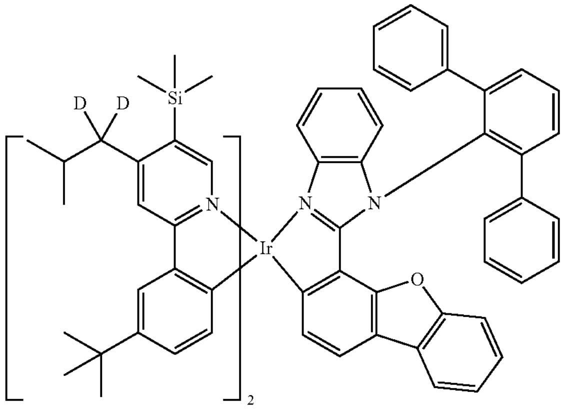
596
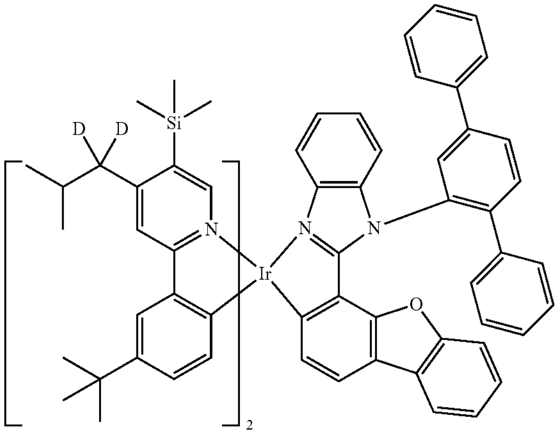
597
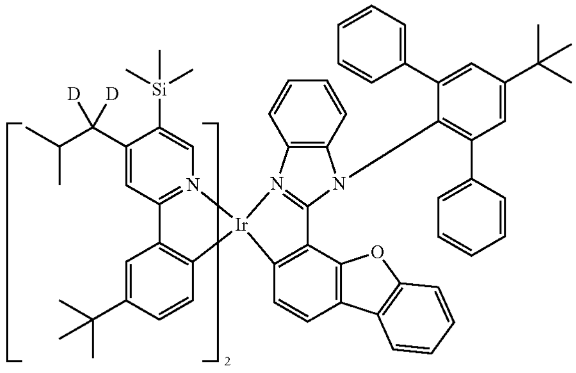

598
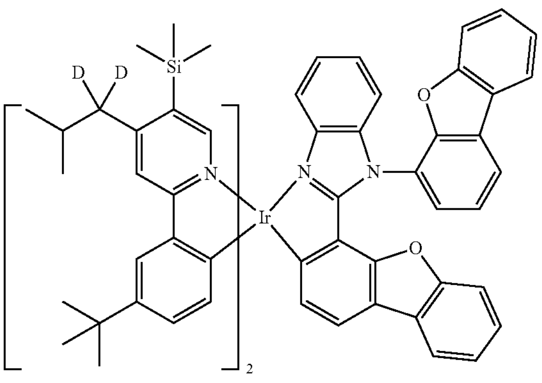
599
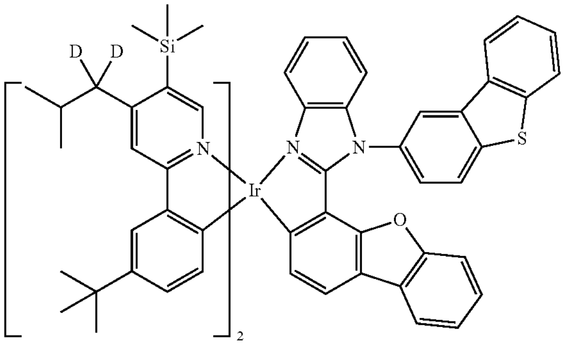
600
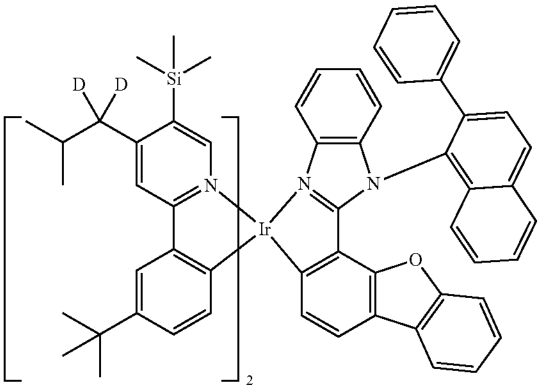
601
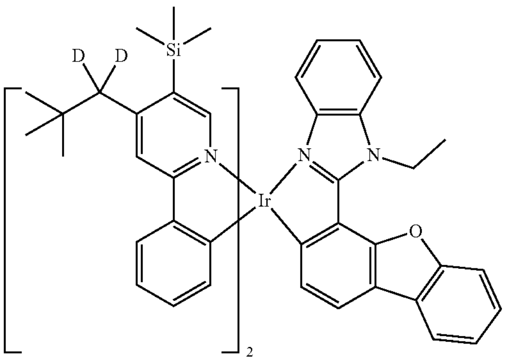
602
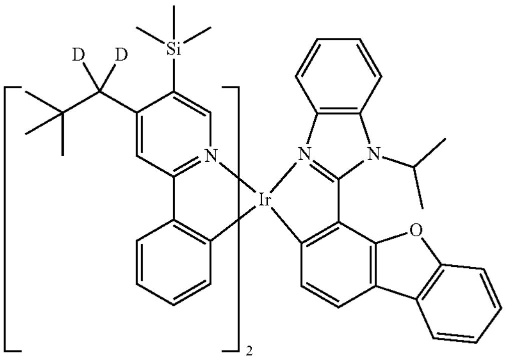
603
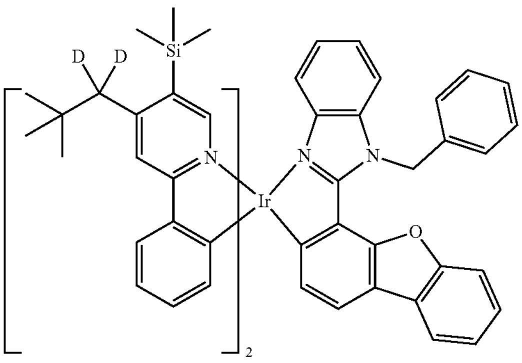
604
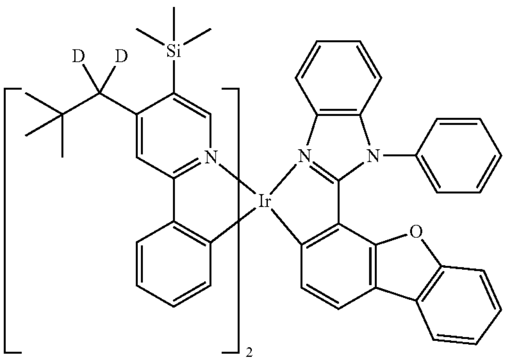
605
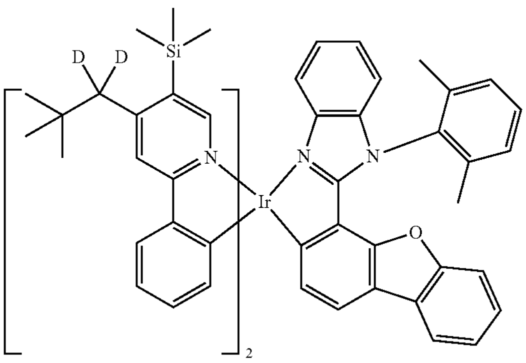

-continued
606
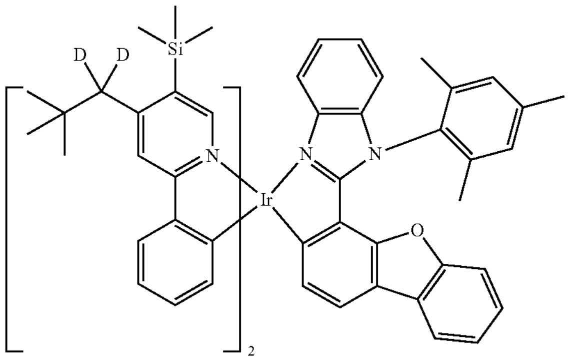
607
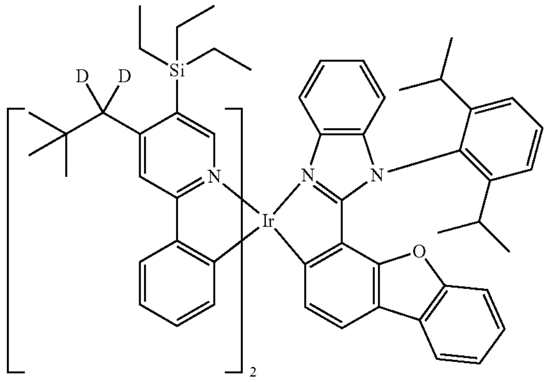
608
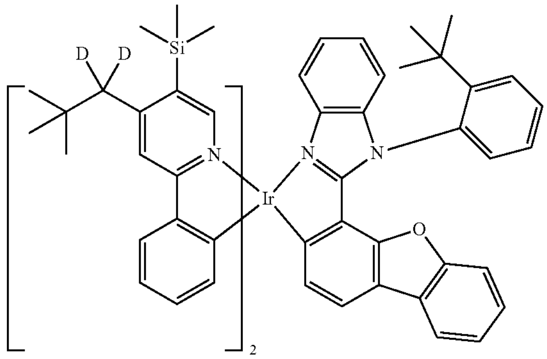
609
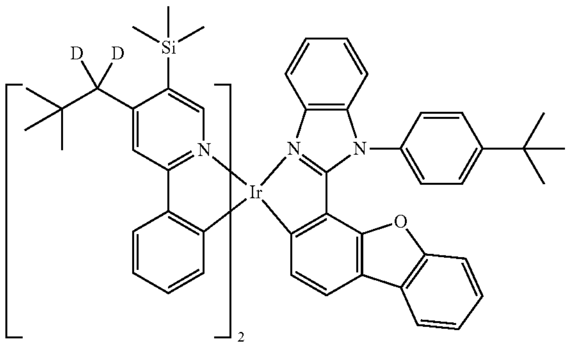
-continued
610
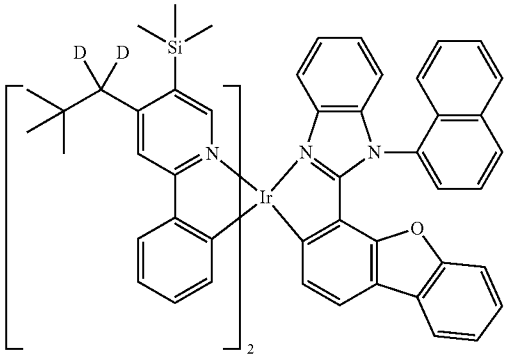
611
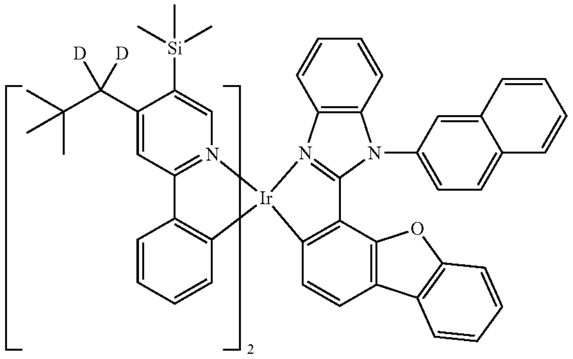
612
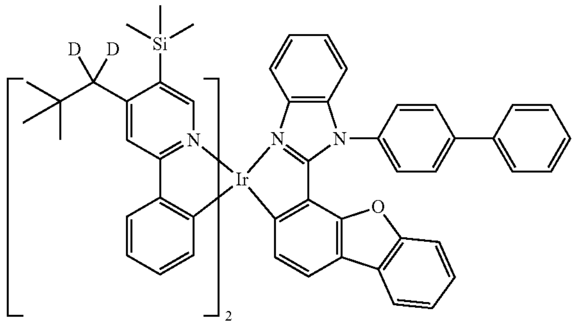
613
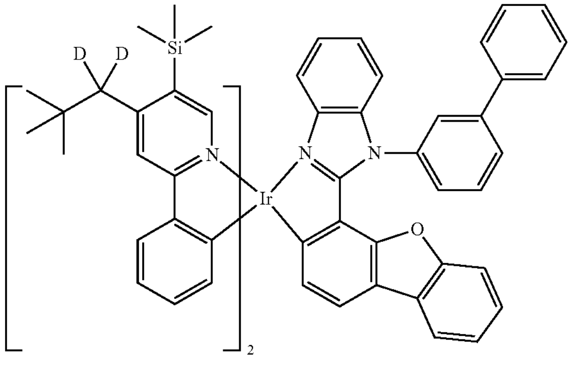

-continued
614
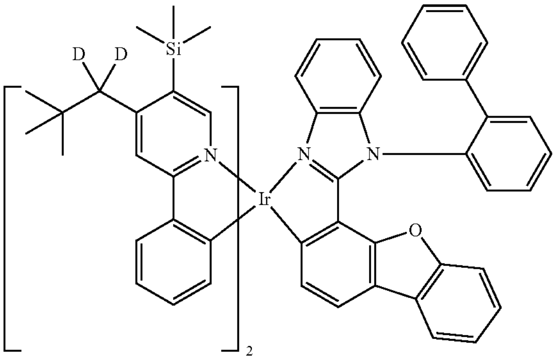
615
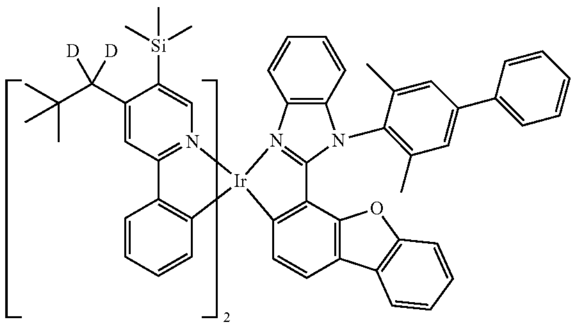
616
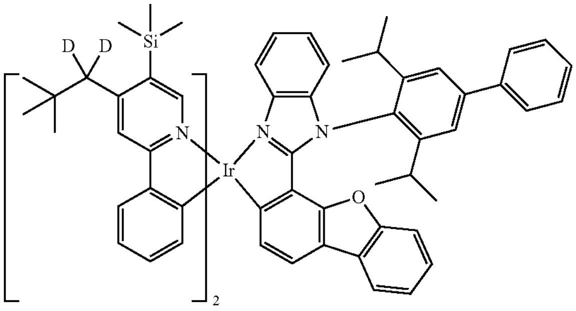
617
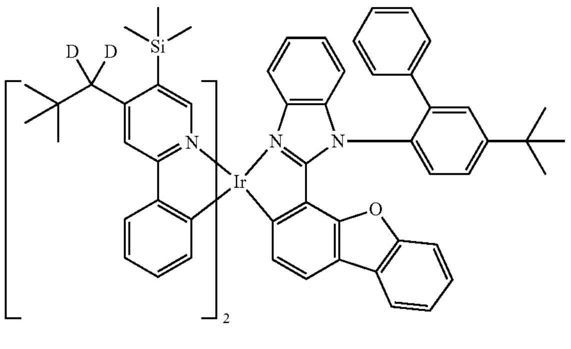
-continued
618
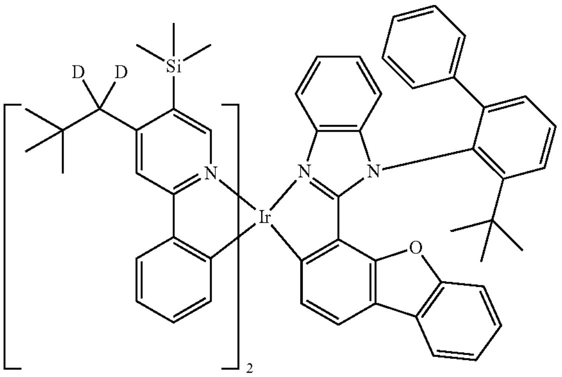
619
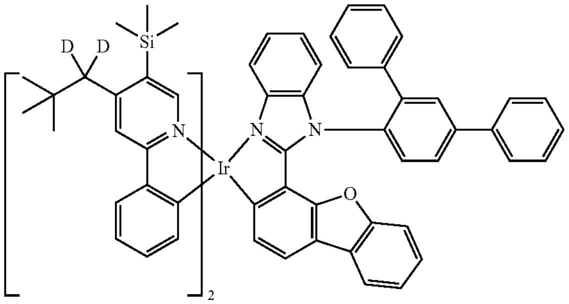
620
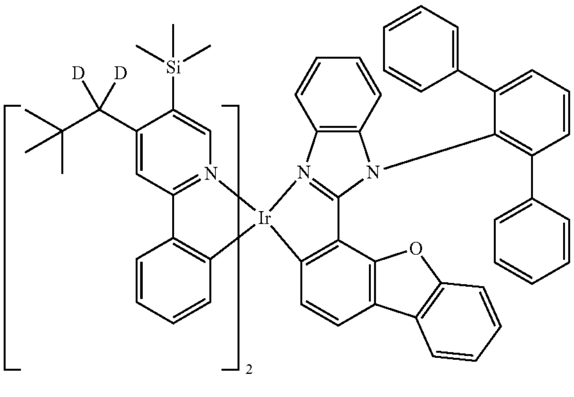
621
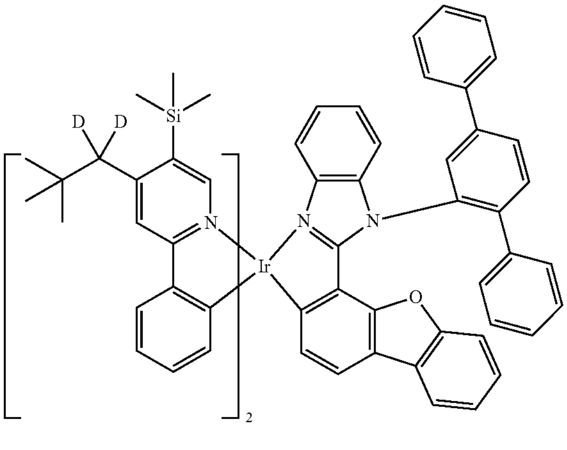

-continued
622
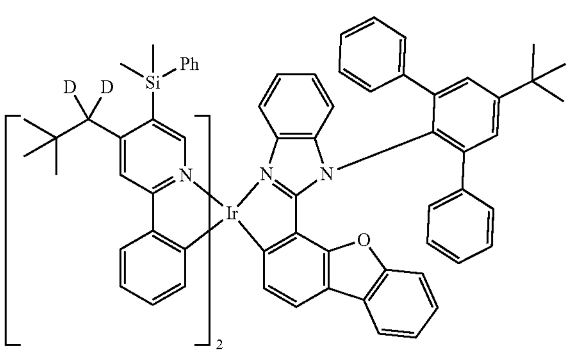
623
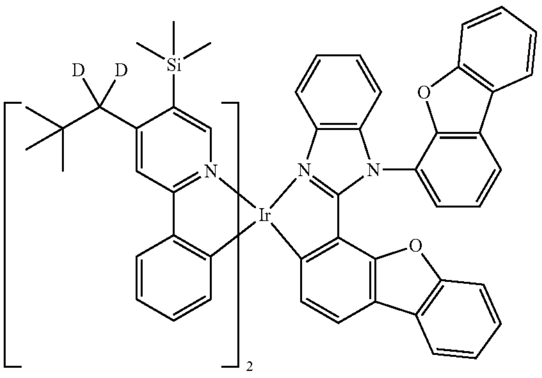
624
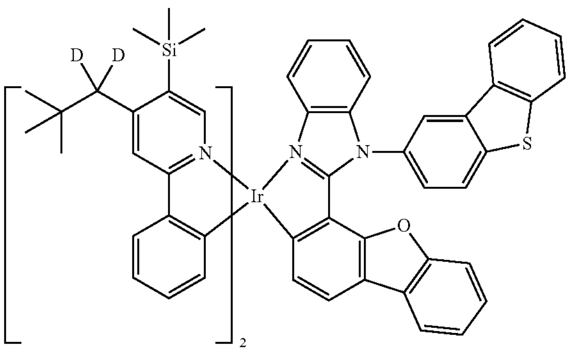
625
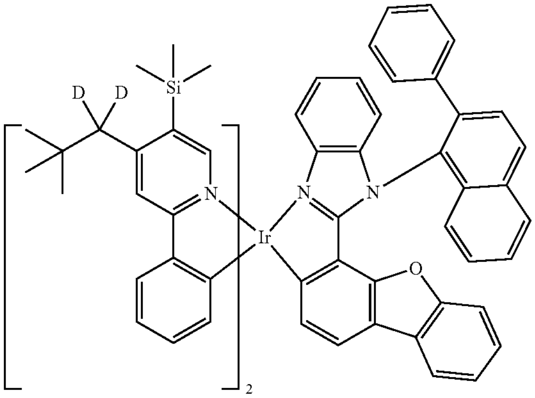
-continued
626
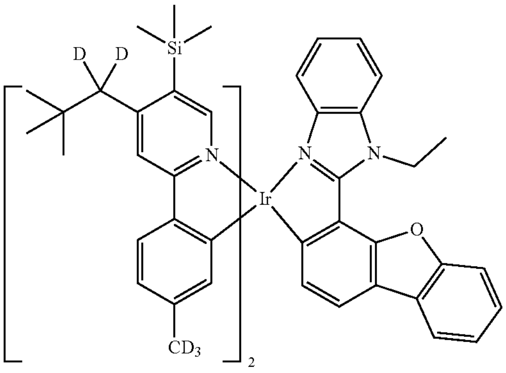
627
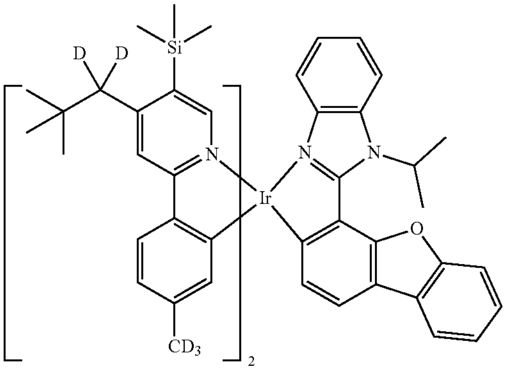
628
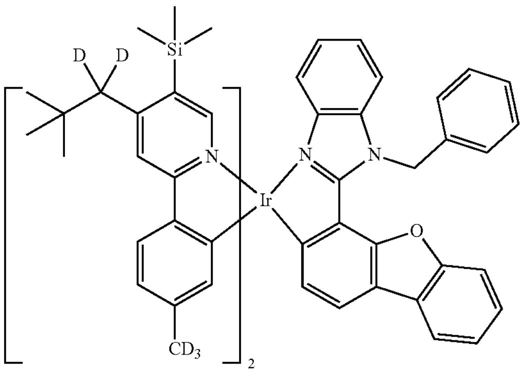
629
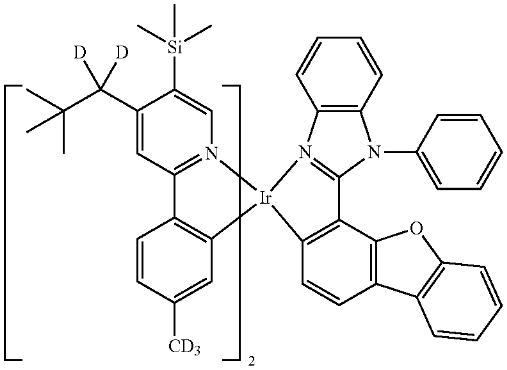

-continued
630
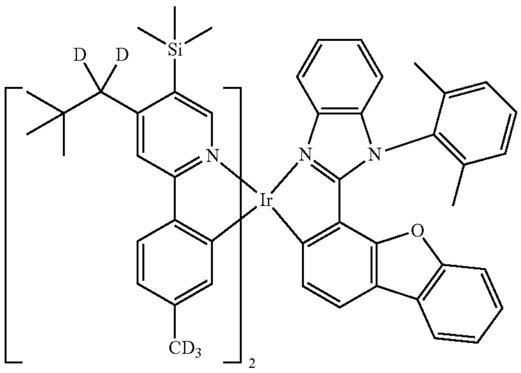
631
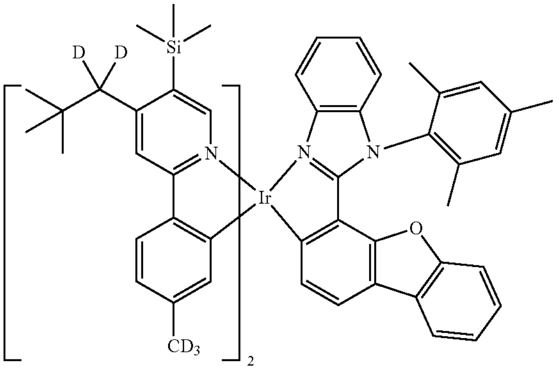
632
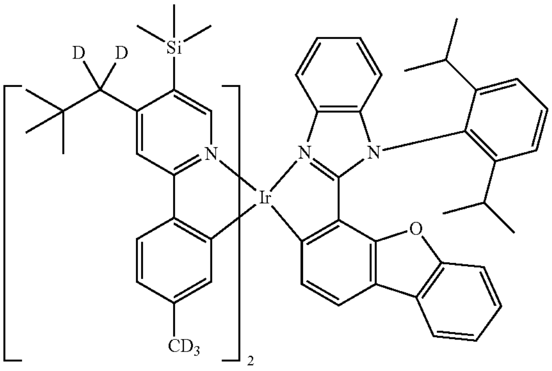
633
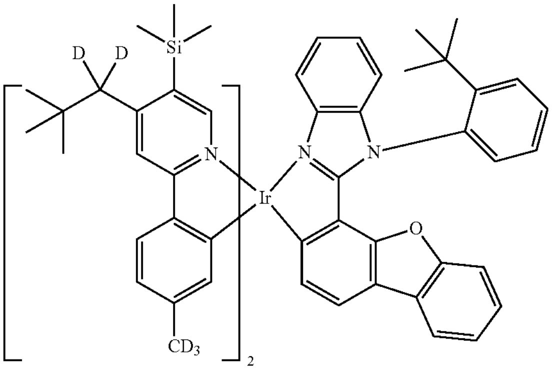
-continued
634
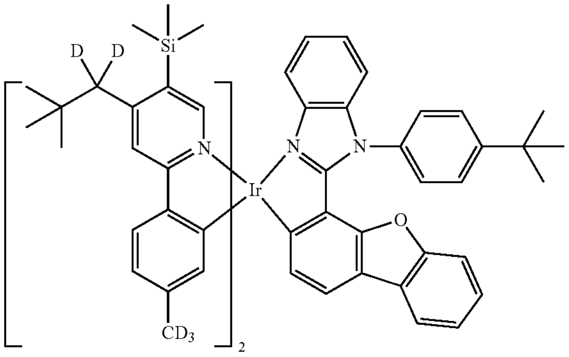
635
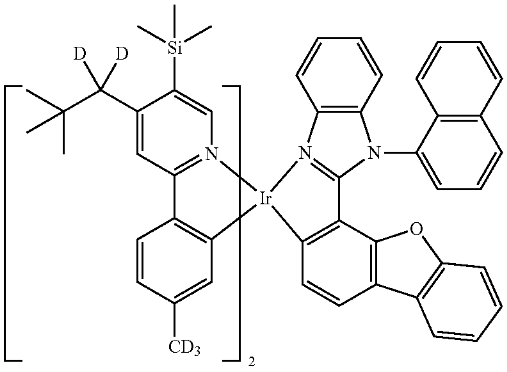
636
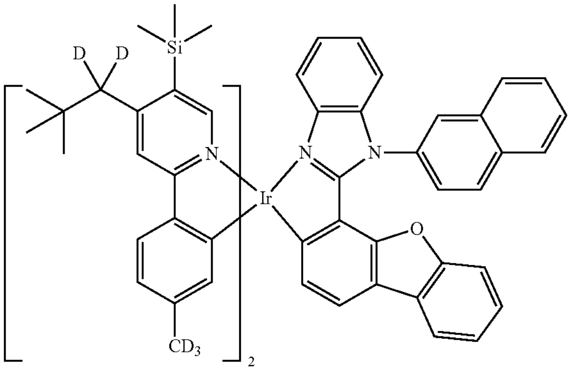
637
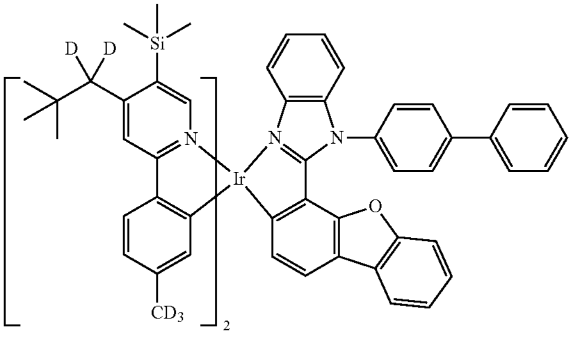

638
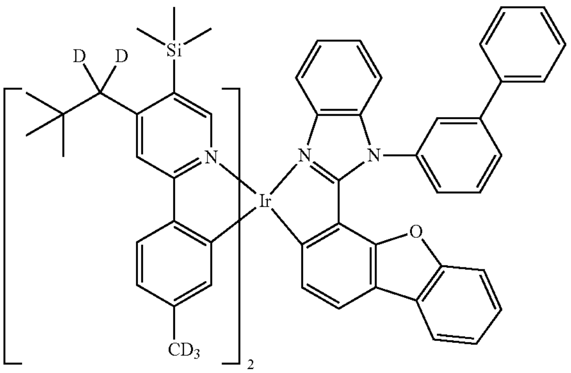
639
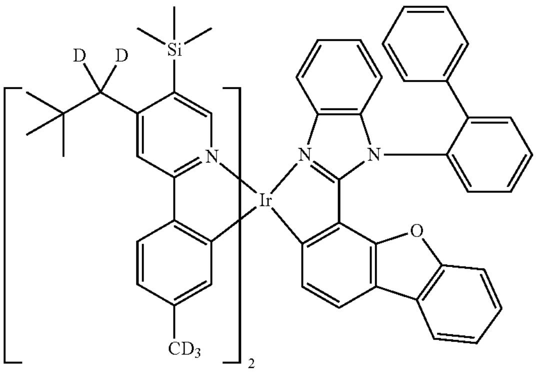
640
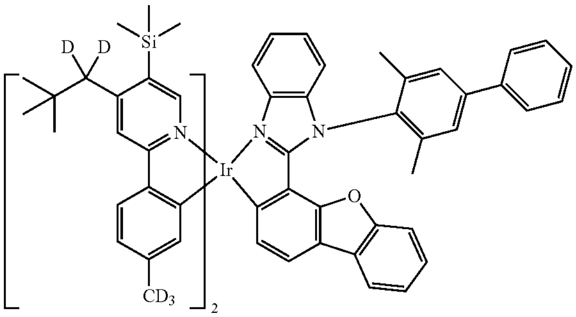
641
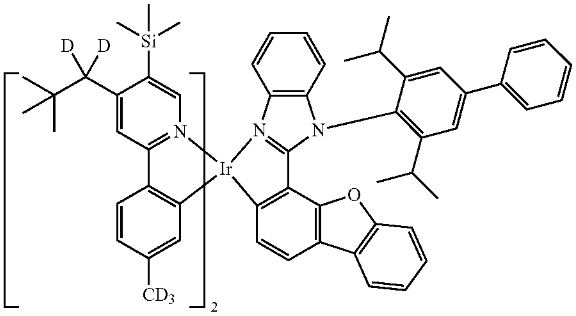
642
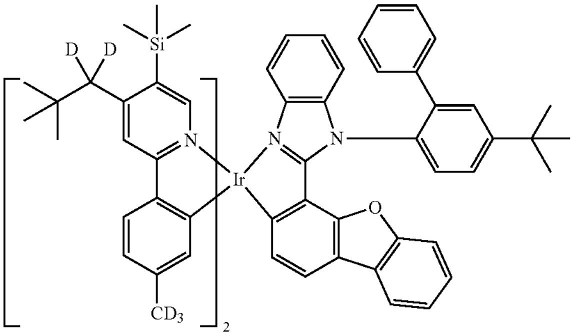
643
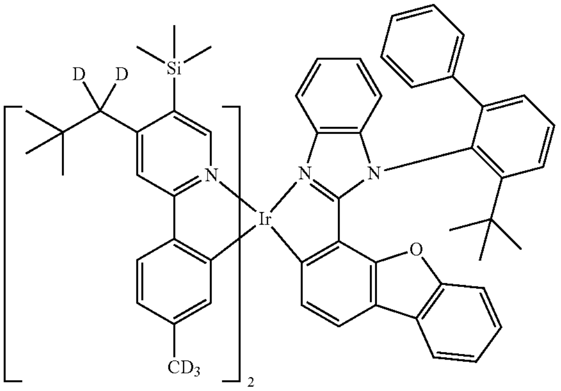
644
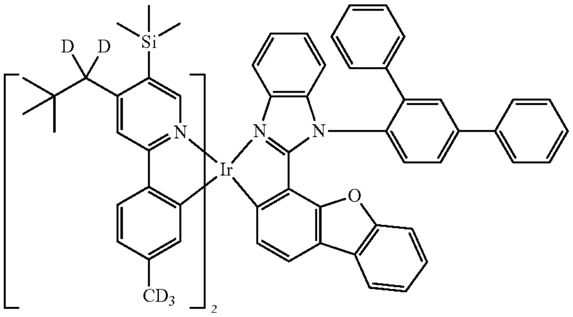
645
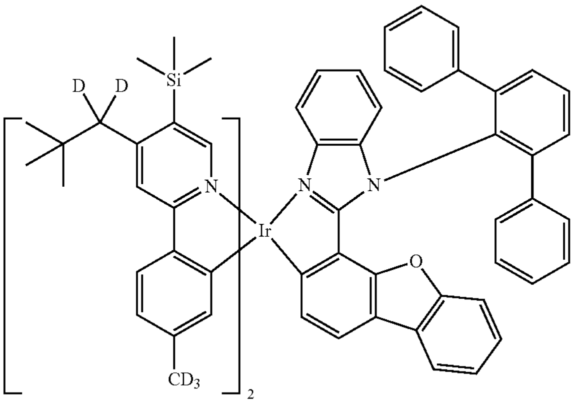

-continued
646
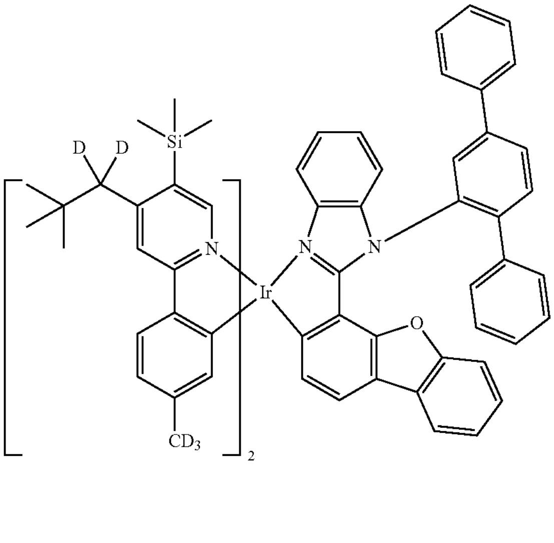
647
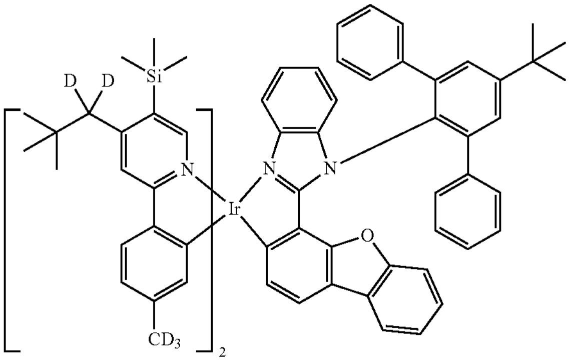
648
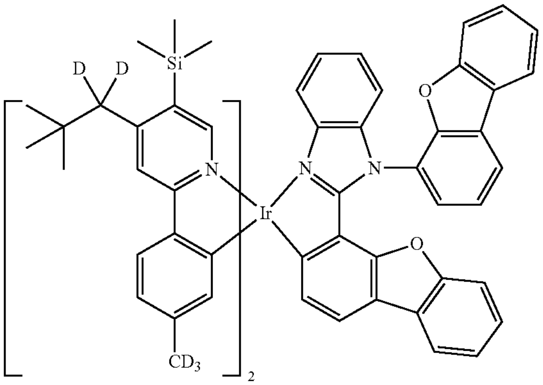
649
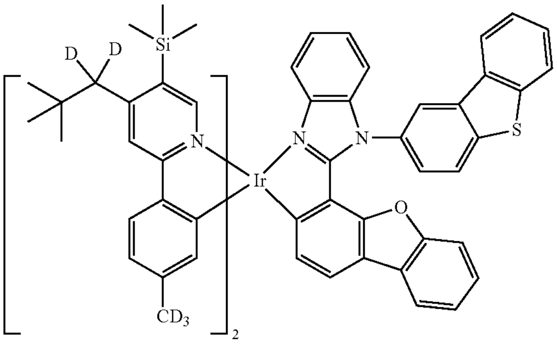
650
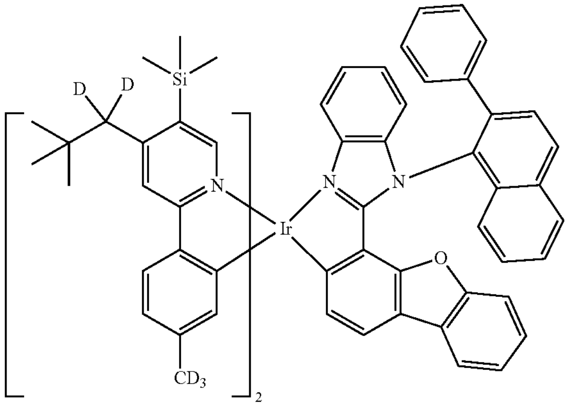
651
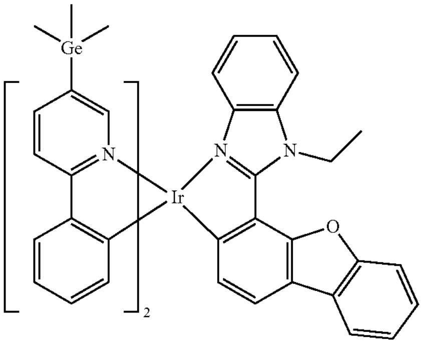
652
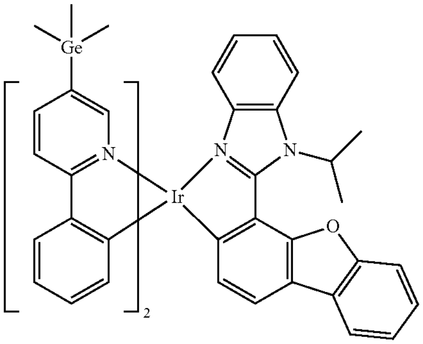

-continued
653
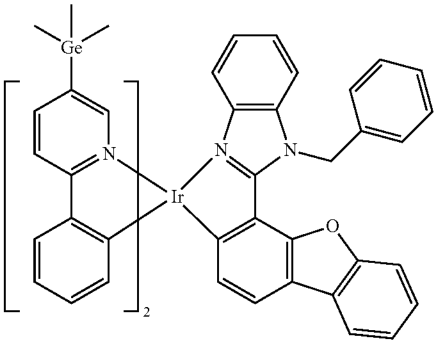
654
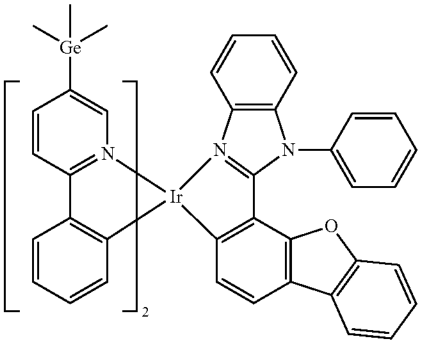
655
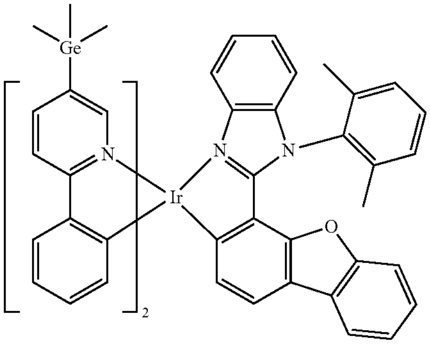
656
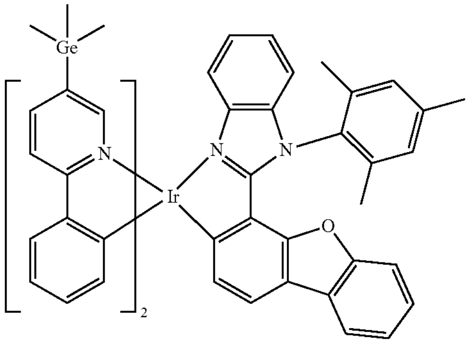
-continued
657
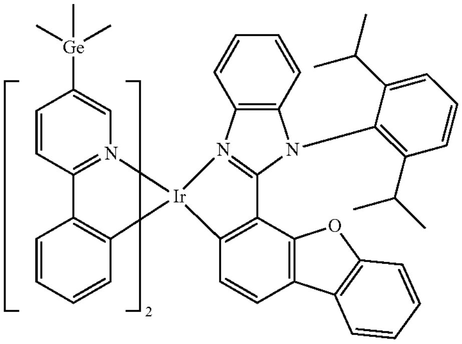
658
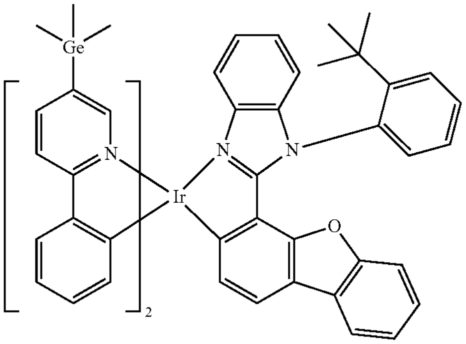
659
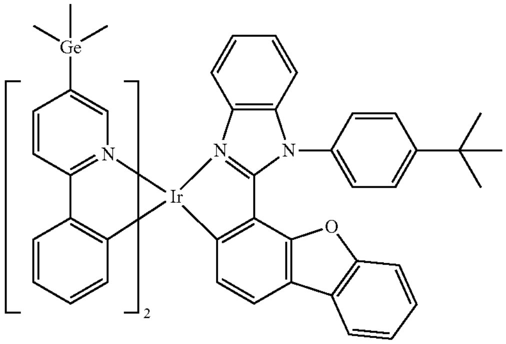
660
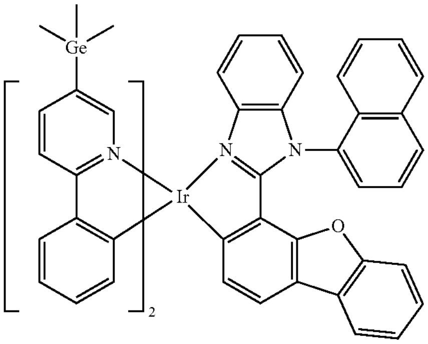

-continued
661
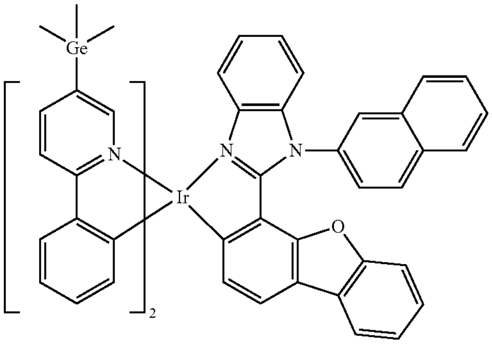
662
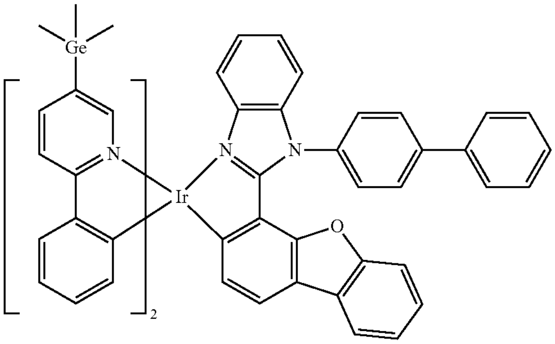
663
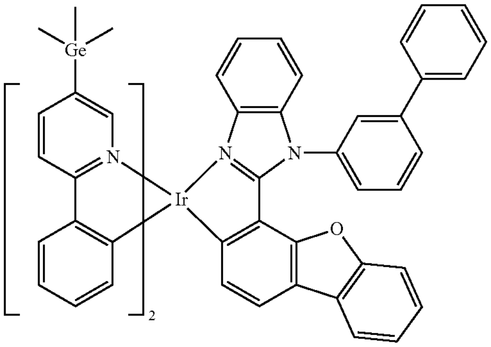
664
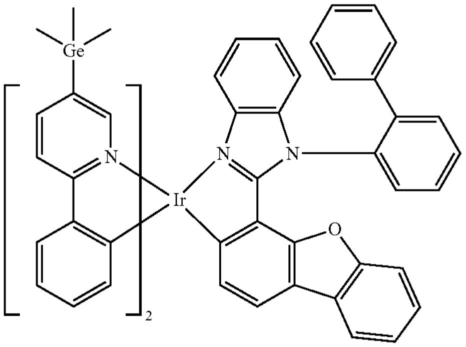
-continued
665
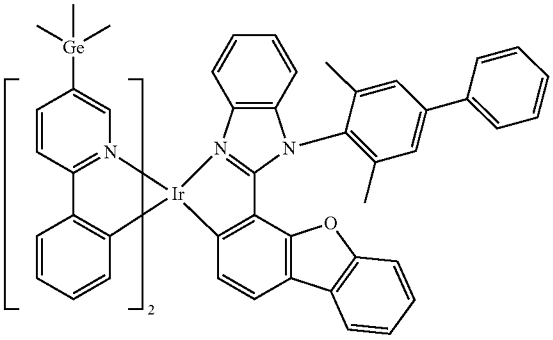
666
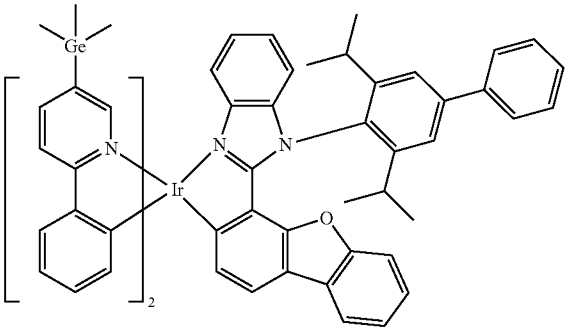
667
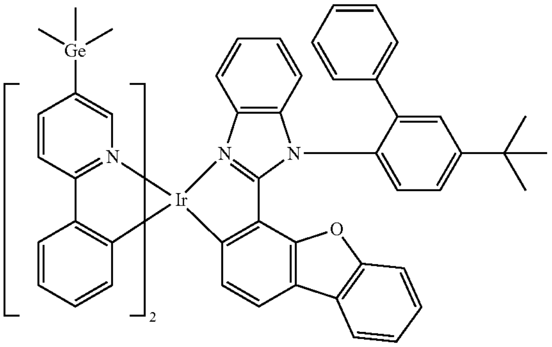
668
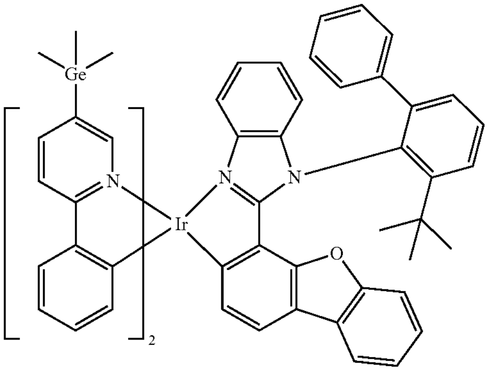

-continued
669
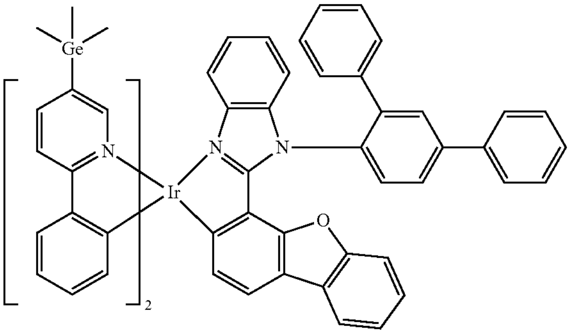
670
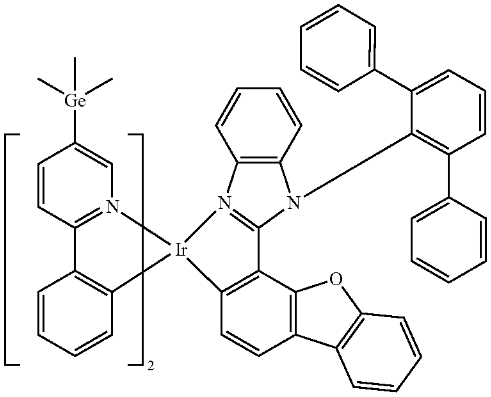
671
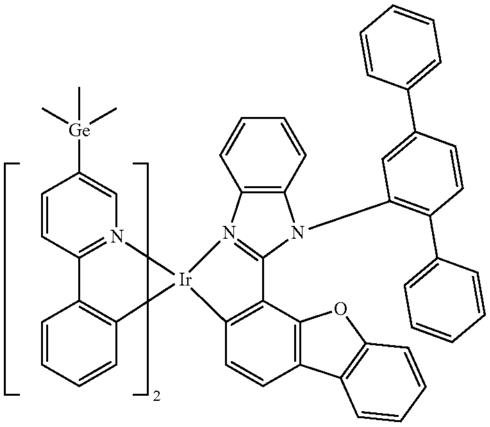
672
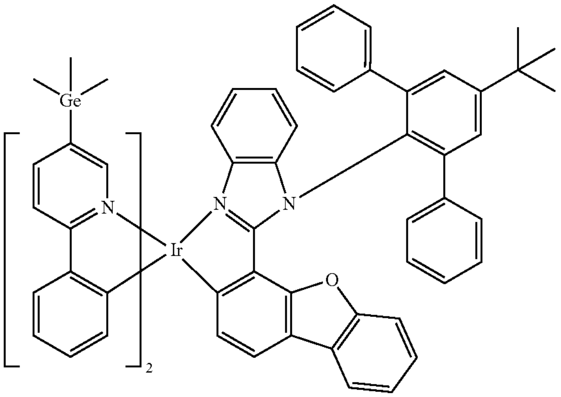
-continued
673
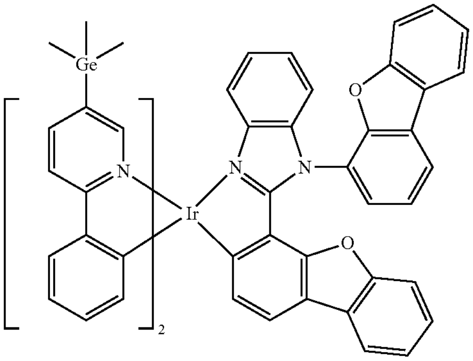
674
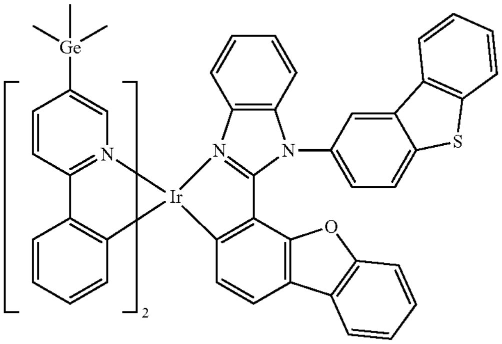
675
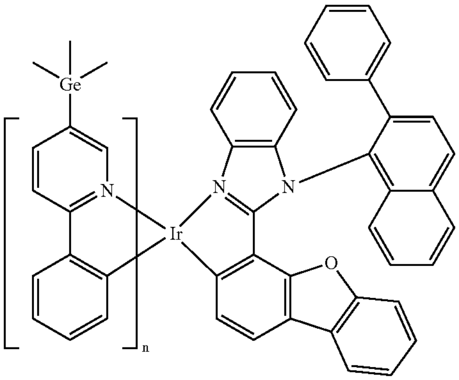
676
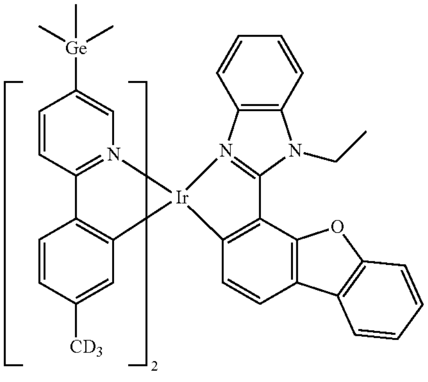

-continued
677
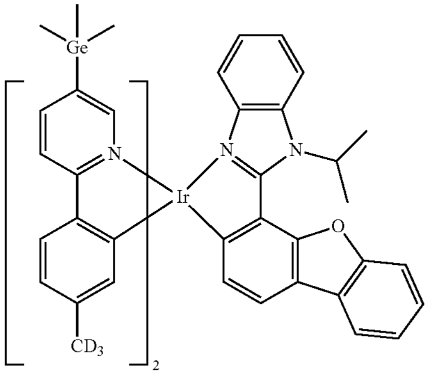
678
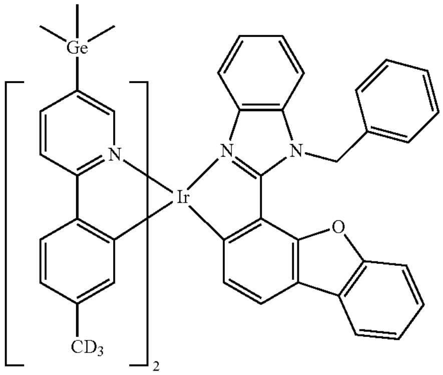
679
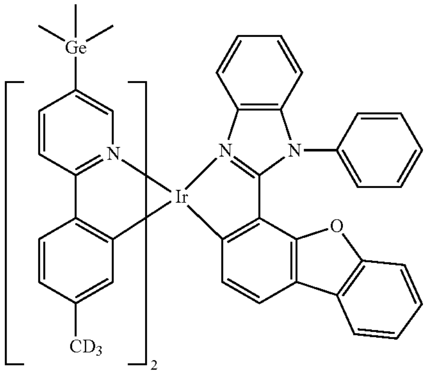
680
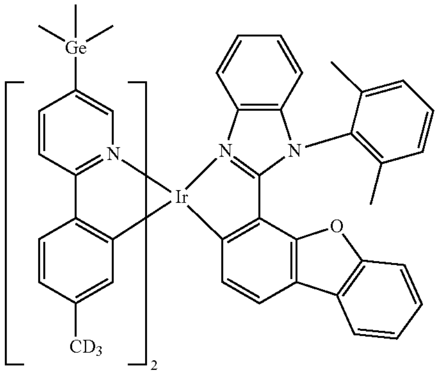
-continued
681
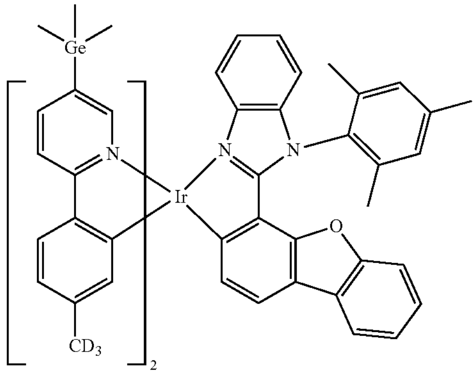
682
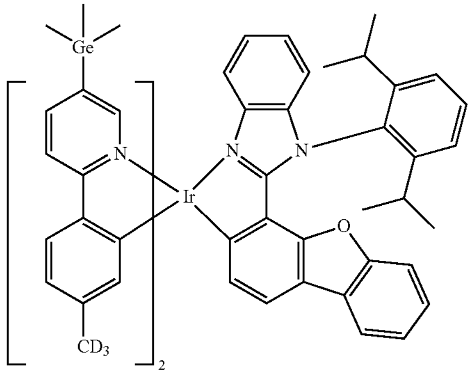
683
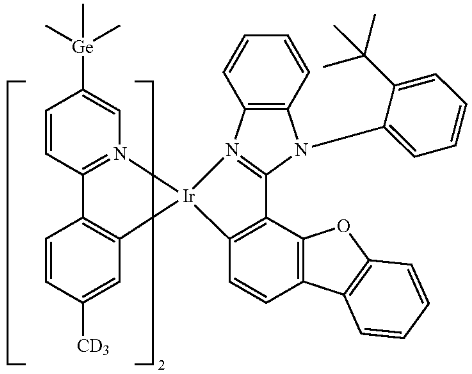
684
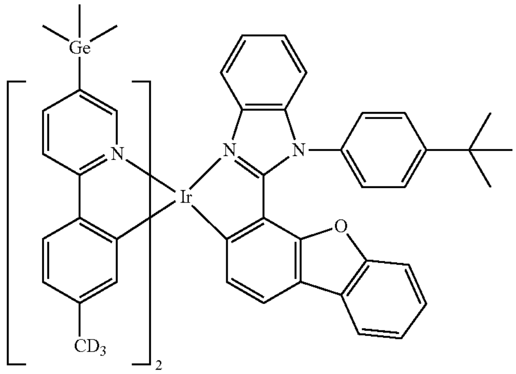

-continued
685
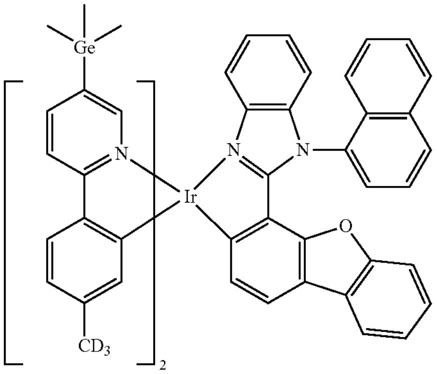
686
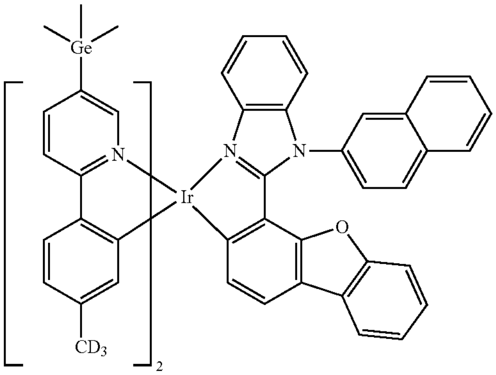
687
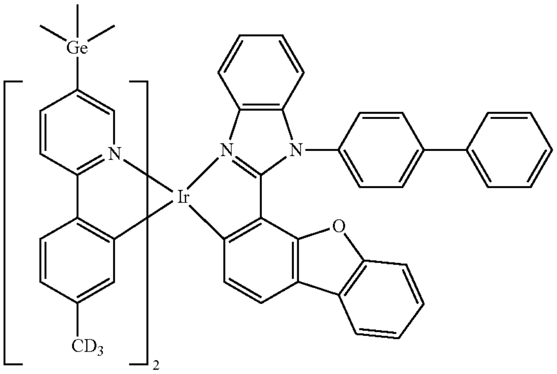
688
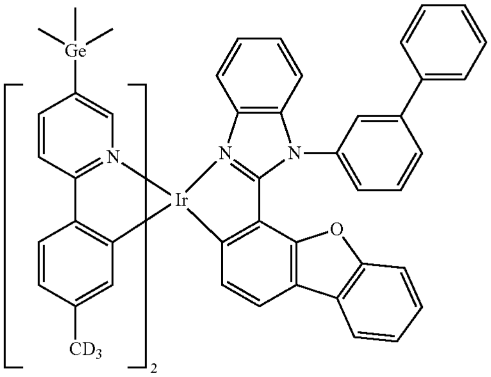
-continued
689
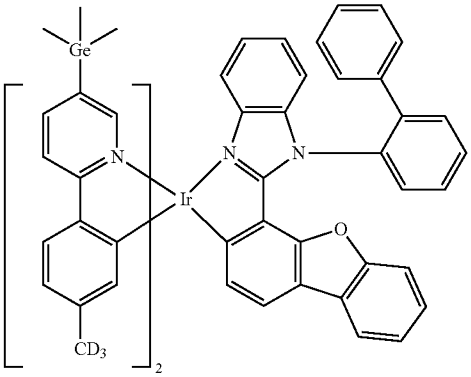
690
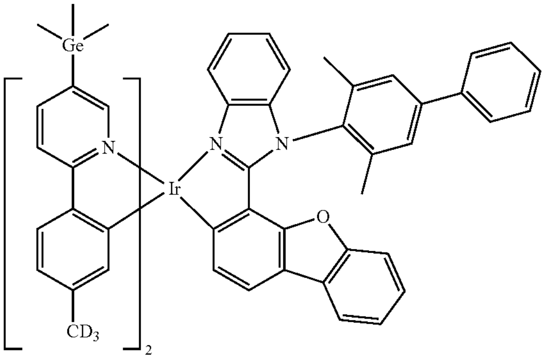
691
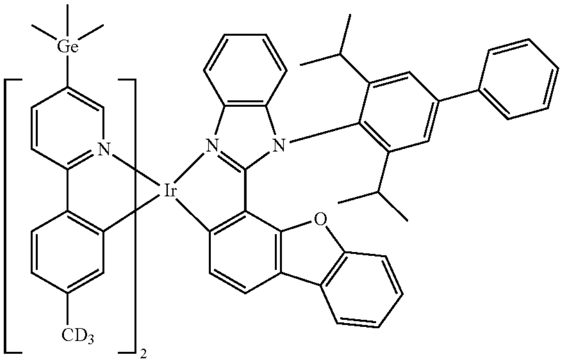
692
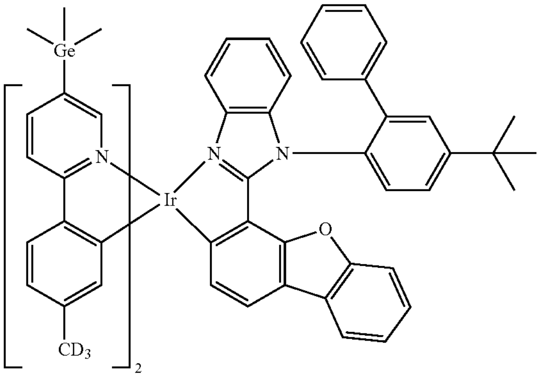

-continued
693
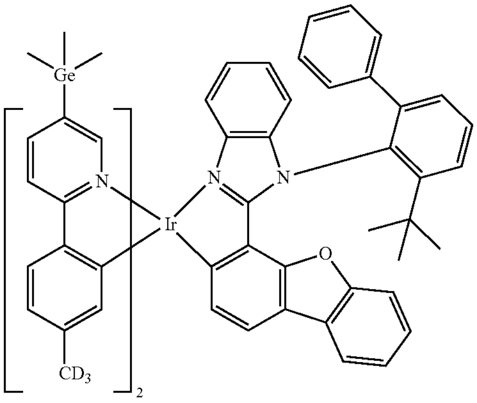
694
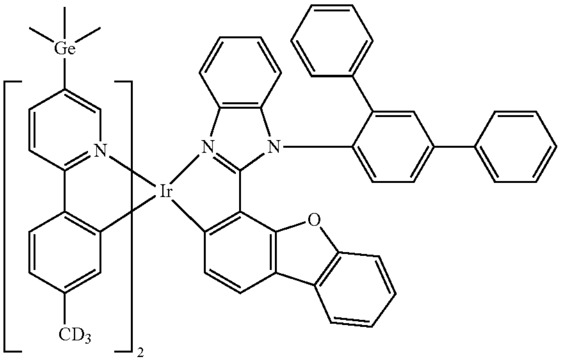
695
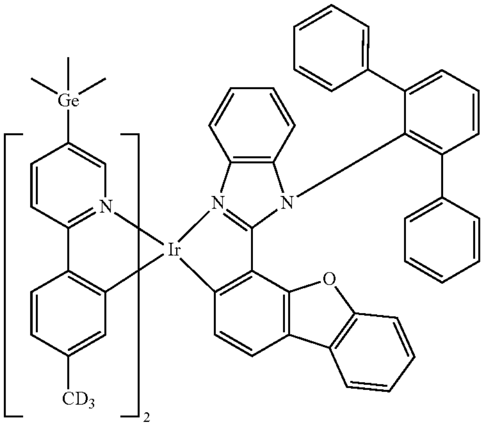
-continued
696
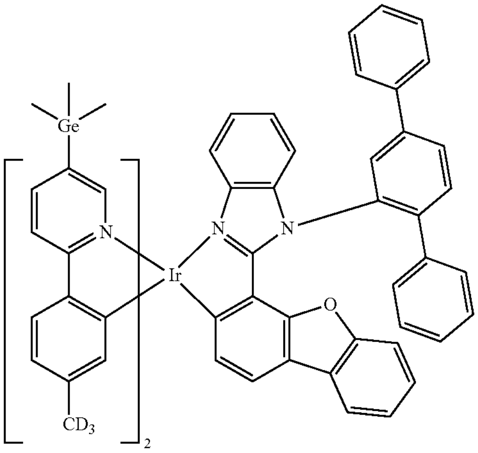
697
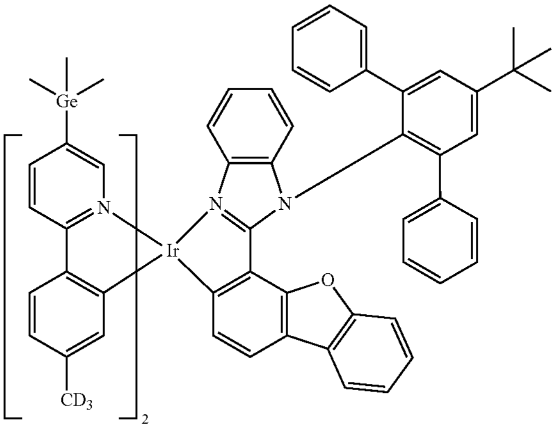
698
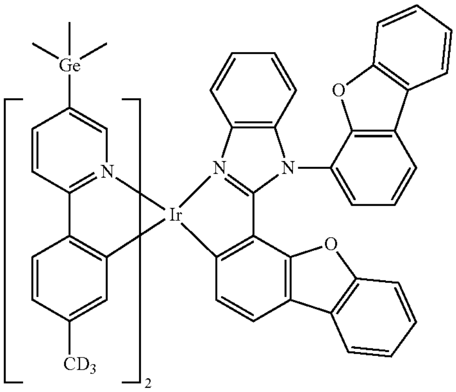

-continued
699
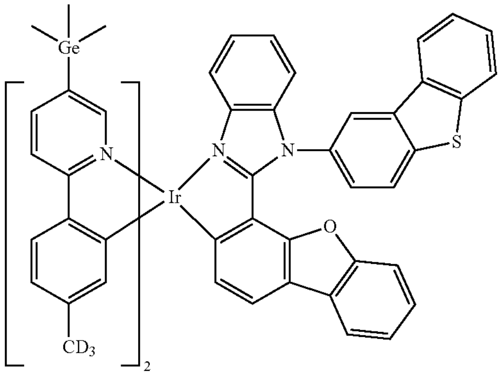
700
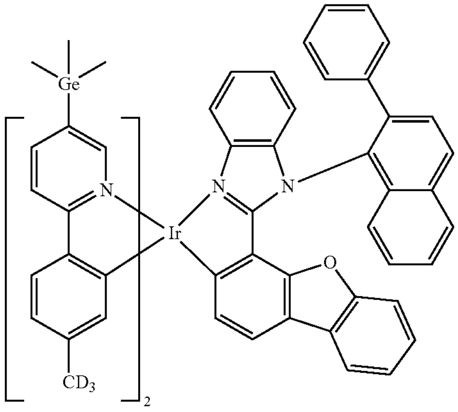
701
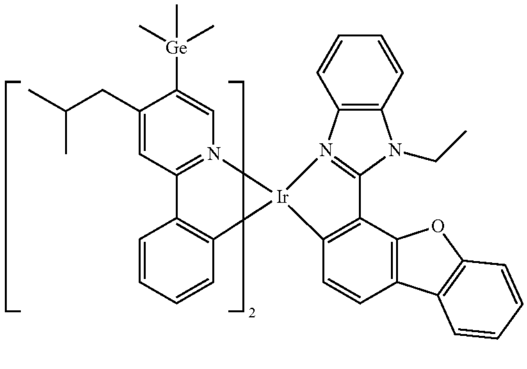
702
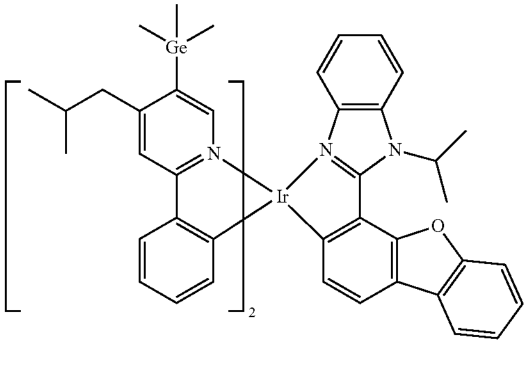
703
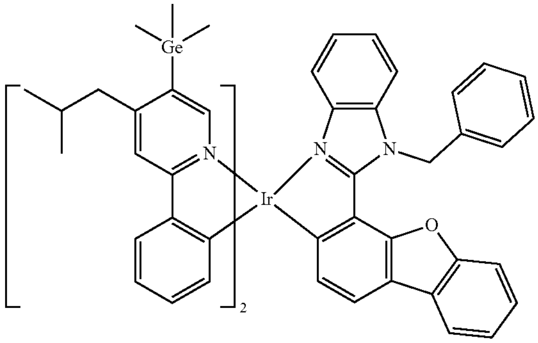
704
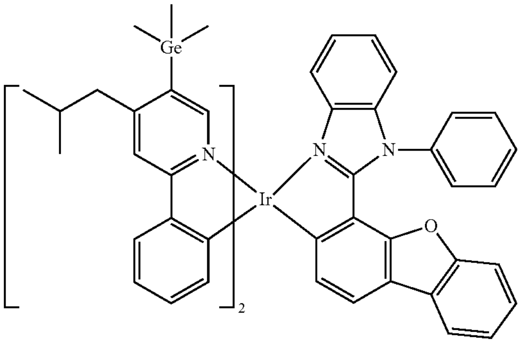
705
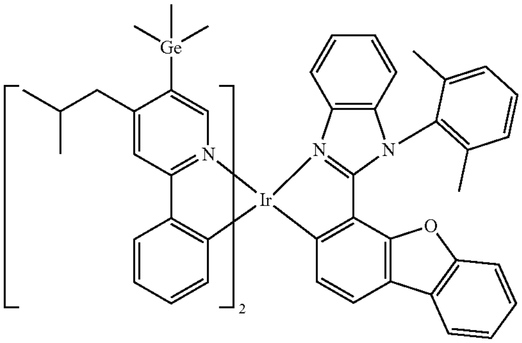
706
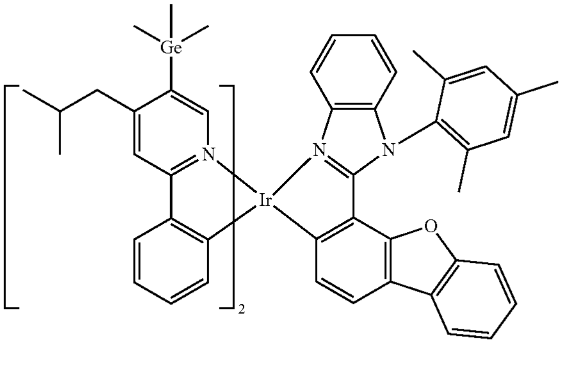

-continued
707
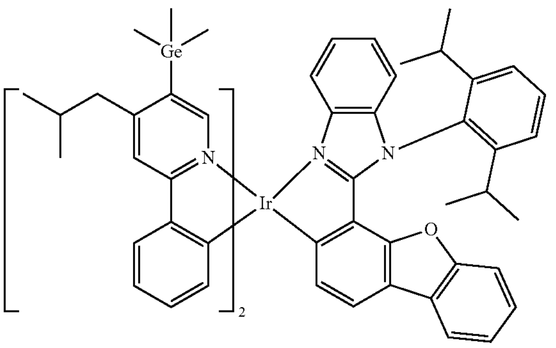
708
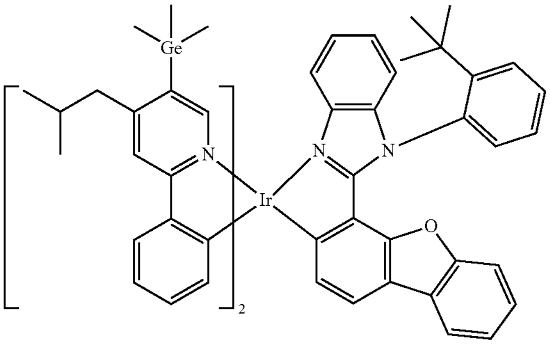
709
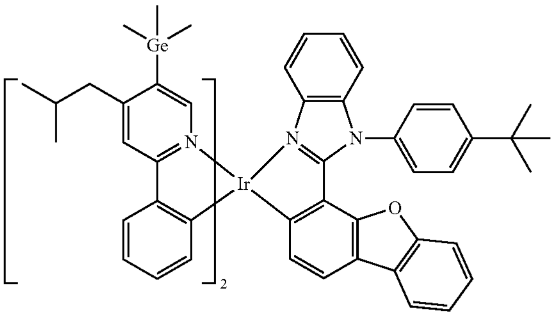
710
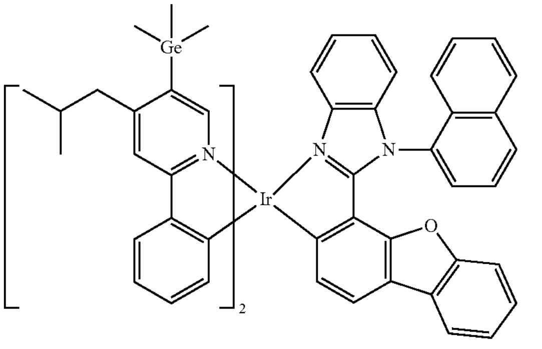
-continued
711
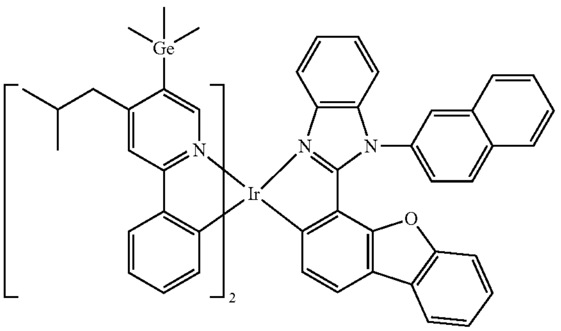
712
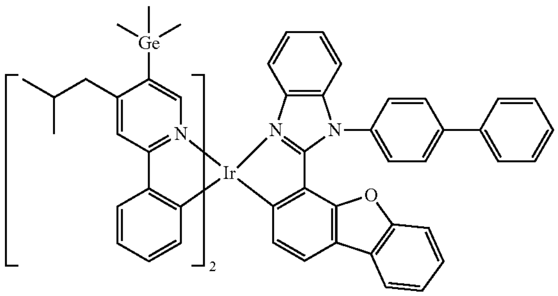
713
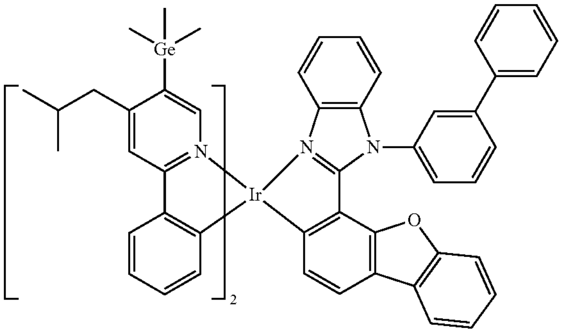
714
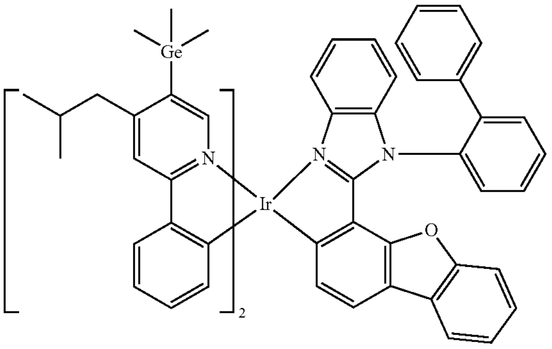

-continued
715
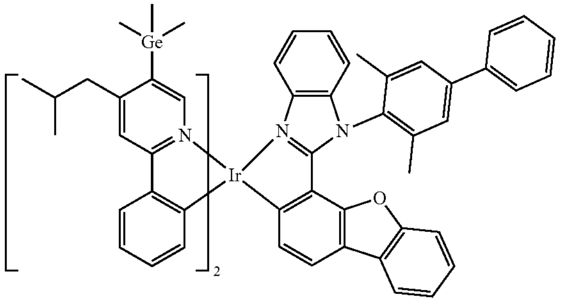
716
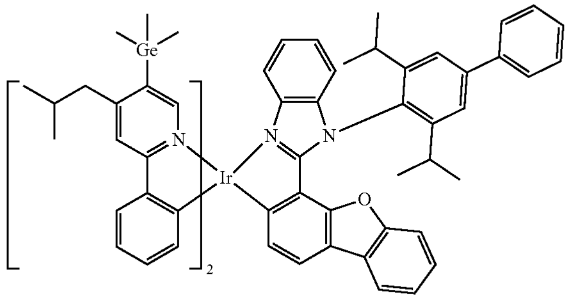
717
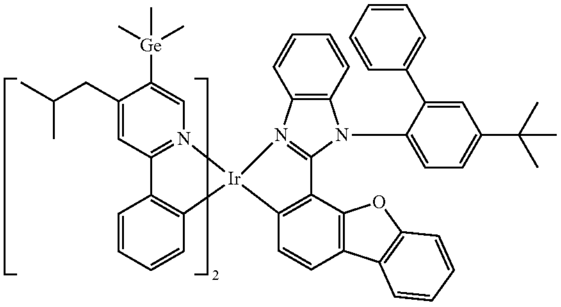
718
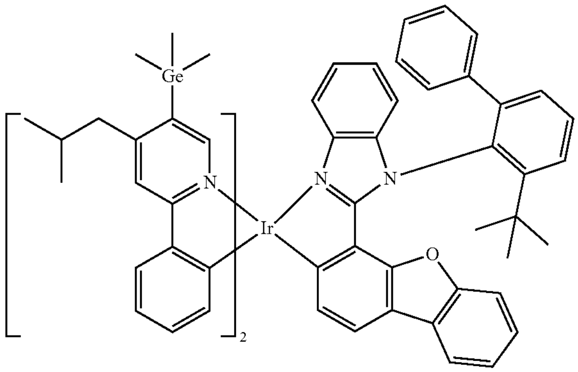
-continued
719
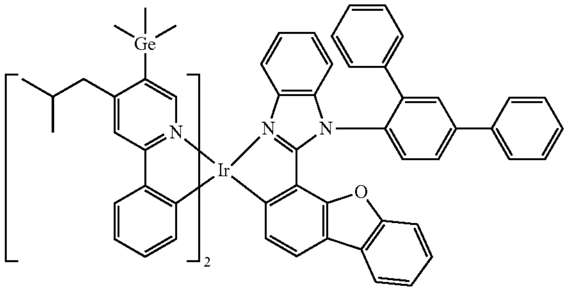
720
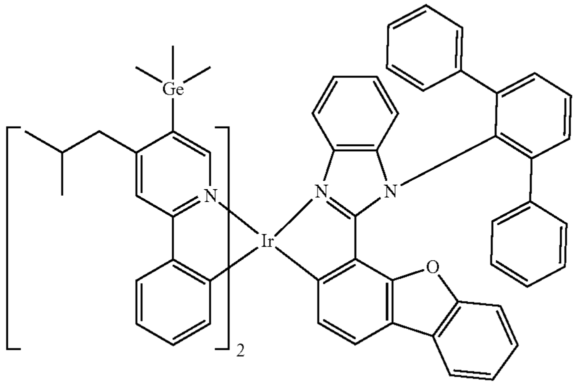
721
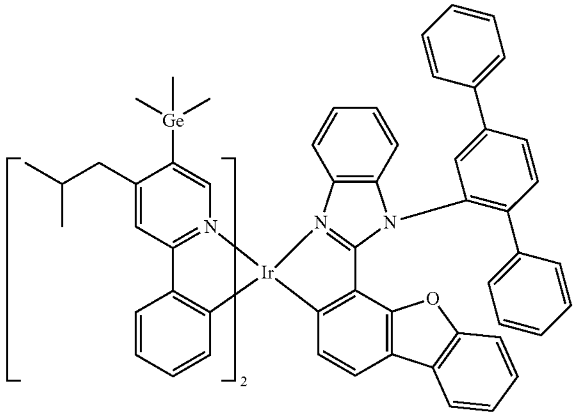
722
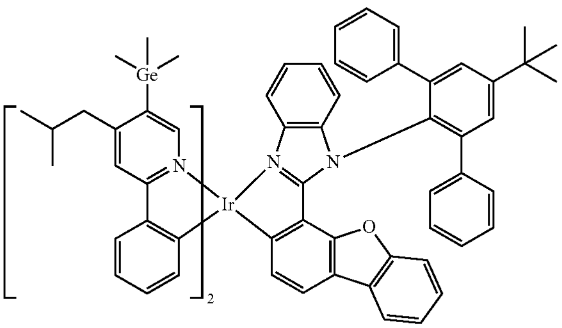

723
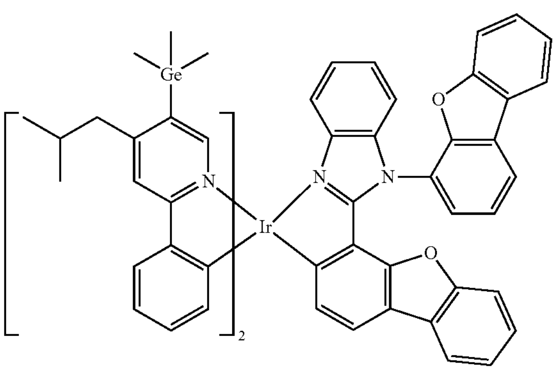
724
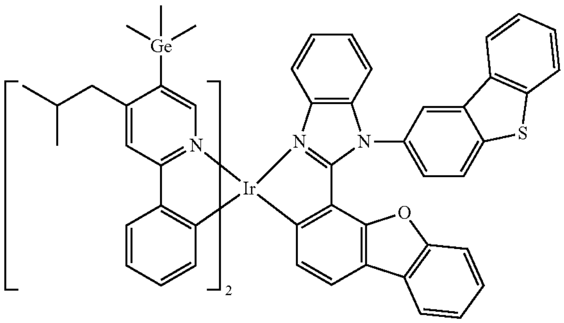
725
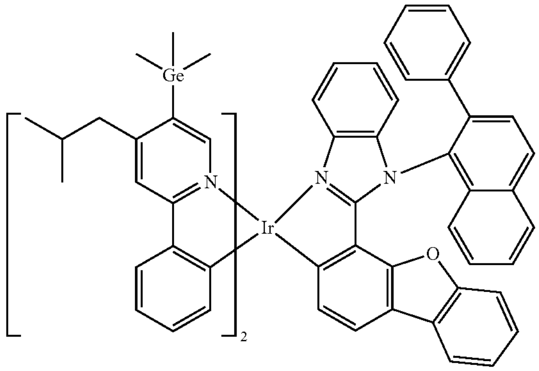
726
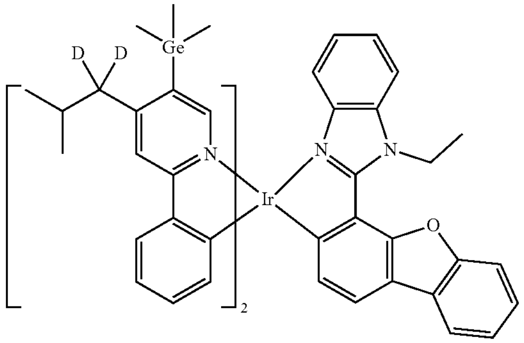
727
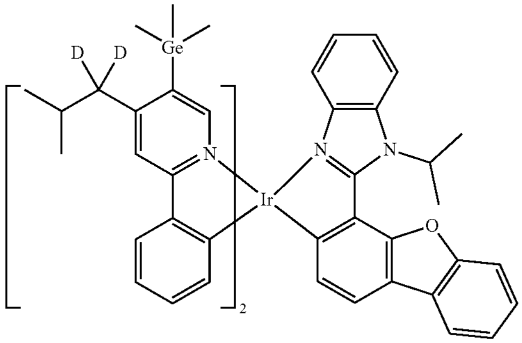
728
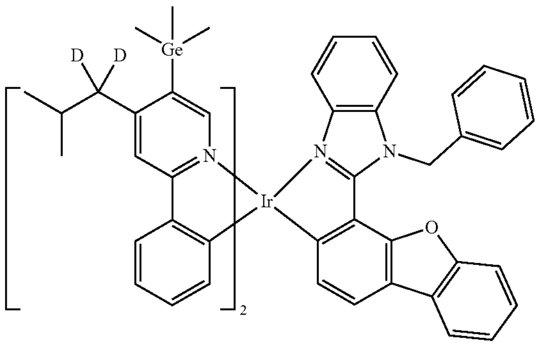
729
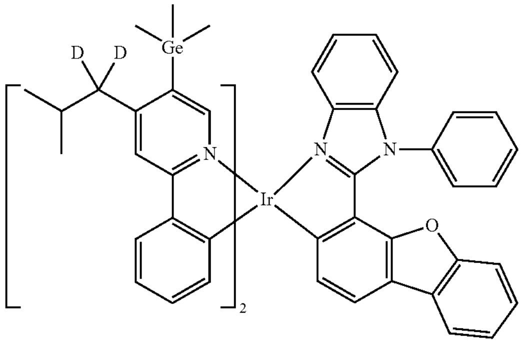
730
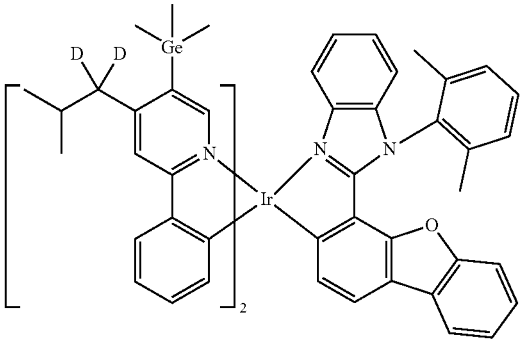

-continued
731
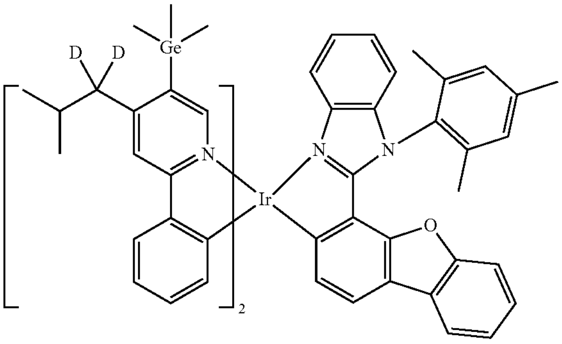
732
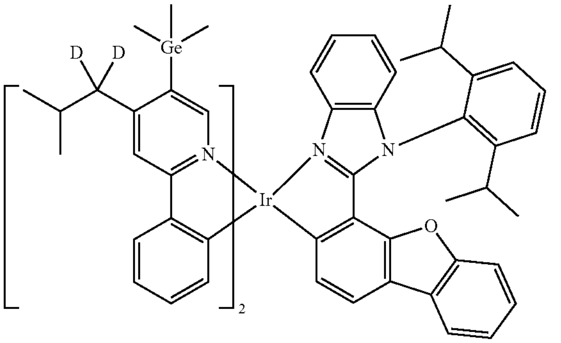
733
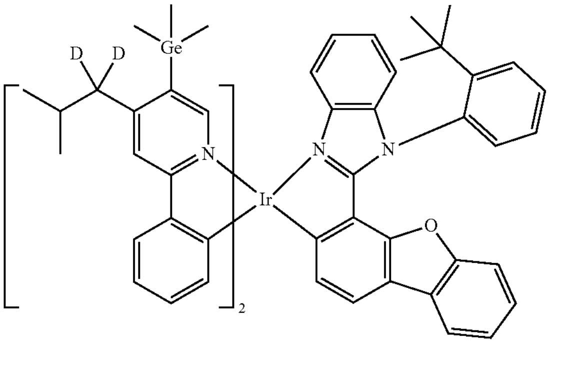
734
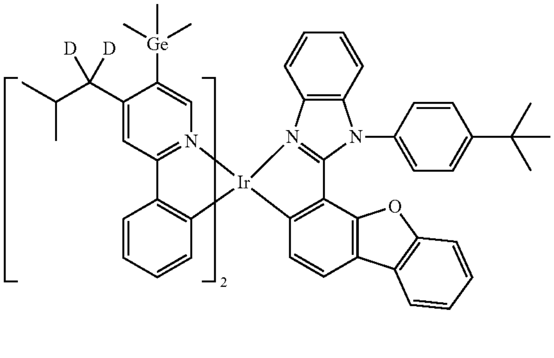
-continued
735
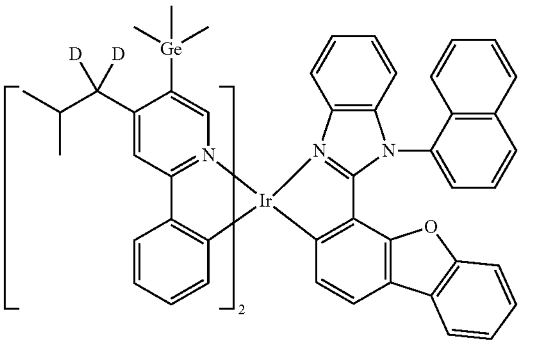
736
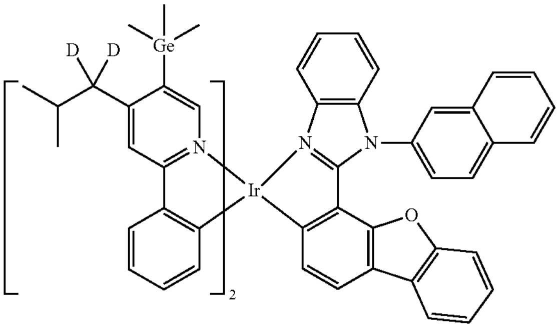
737
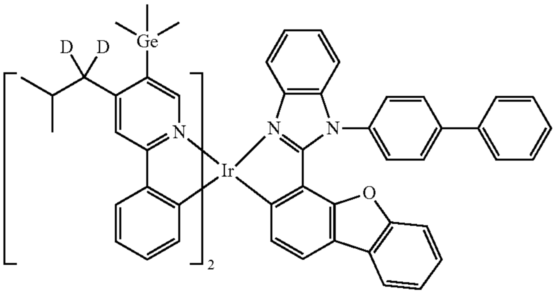
738
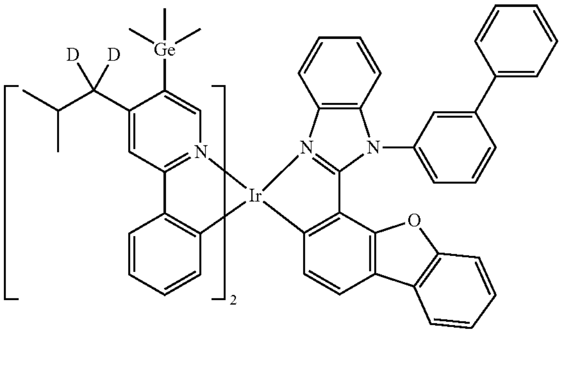

-continued
739
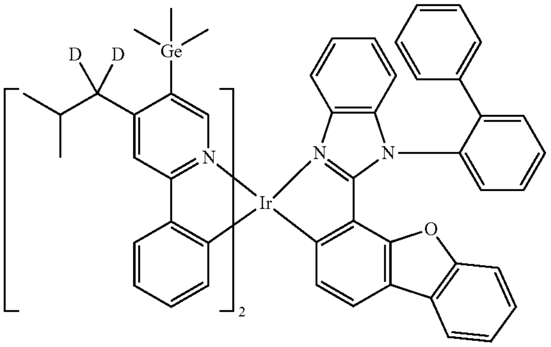
740
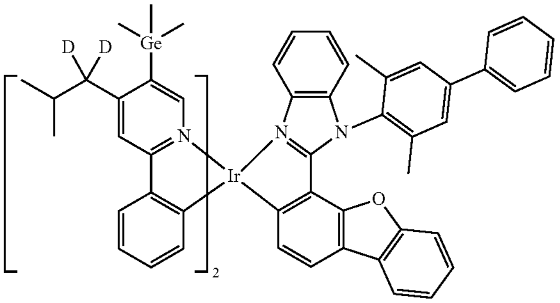
741
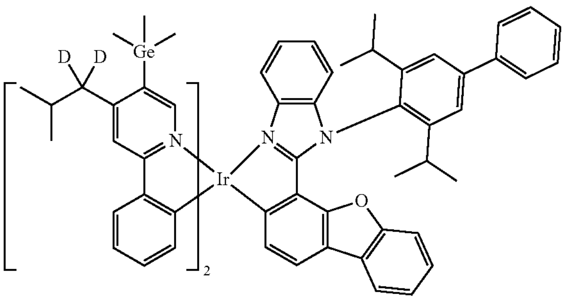
742
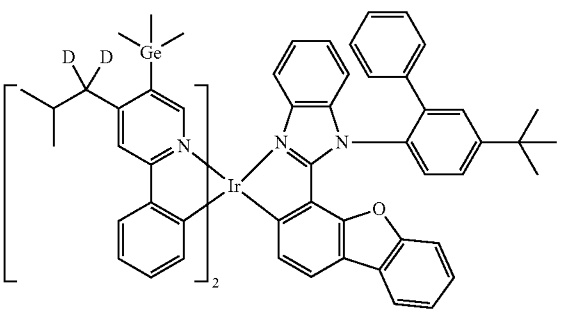
-continued
743
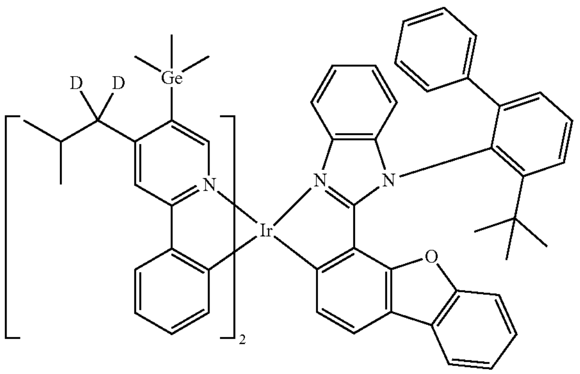
744
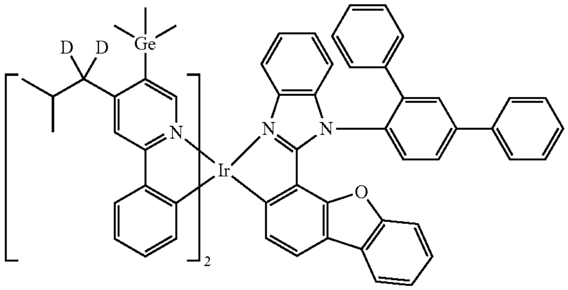
745
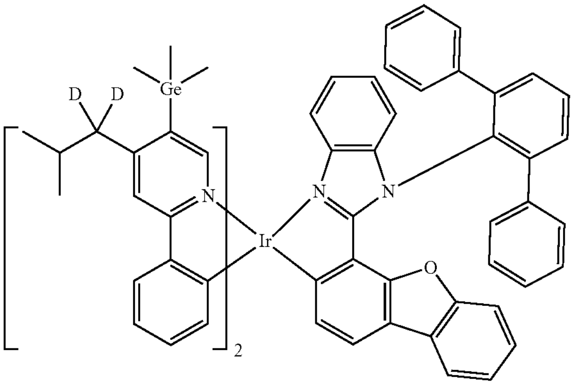
746
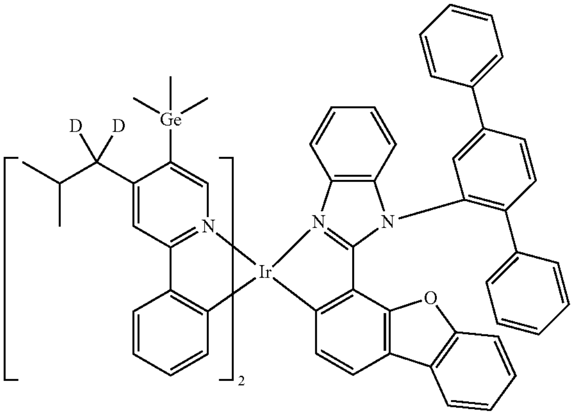

-continued
747
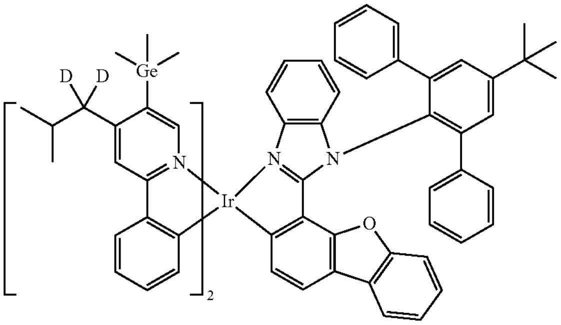
748
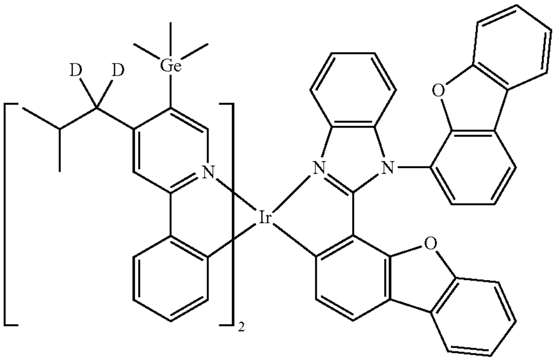
749
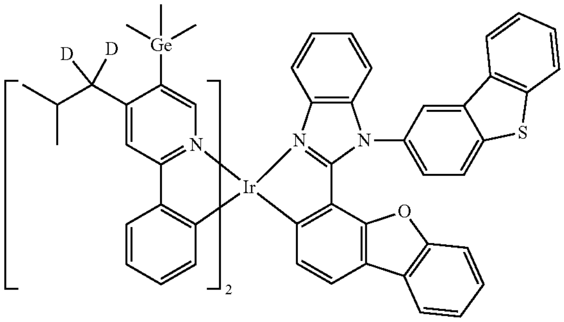
750
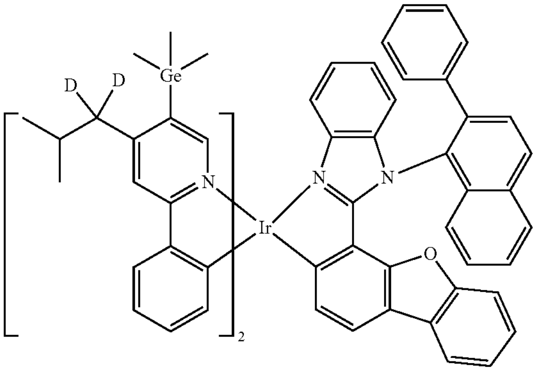
-continued
751
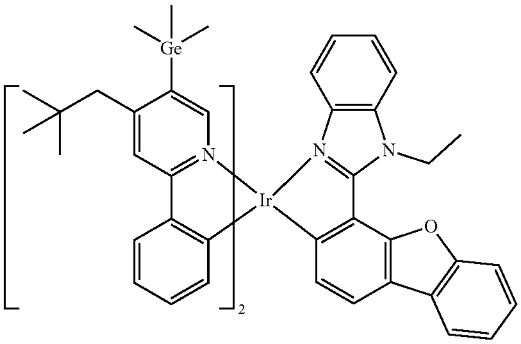
752
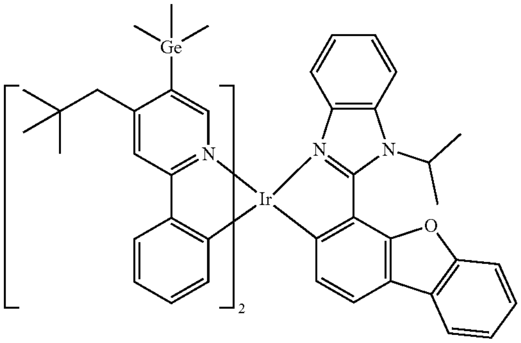
753
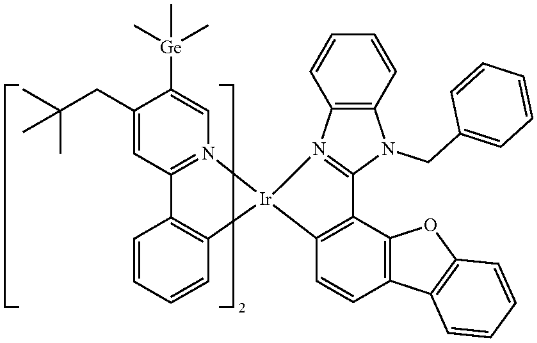
754
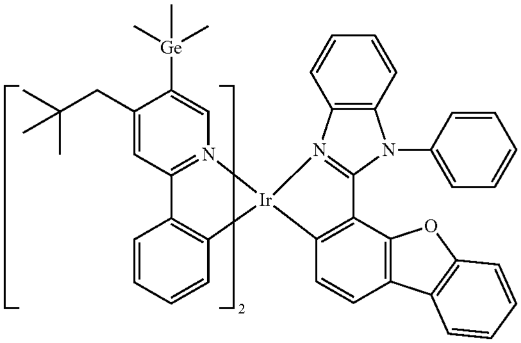

-continued
755
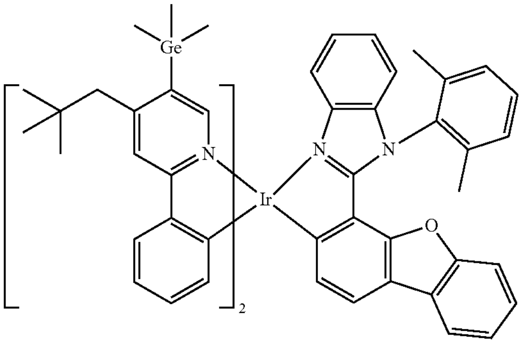
756
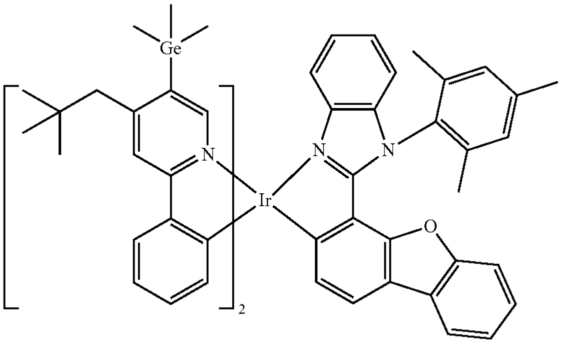
757
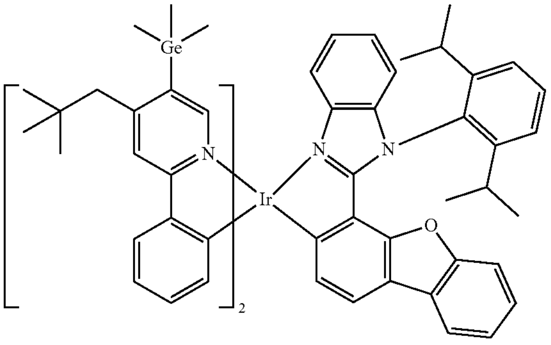
758
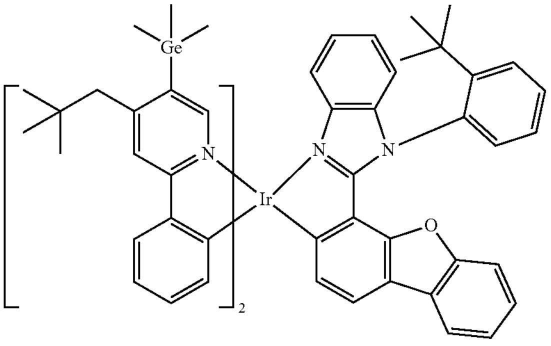
-continued
759
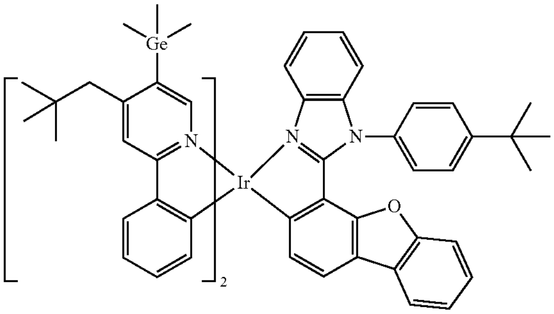
760
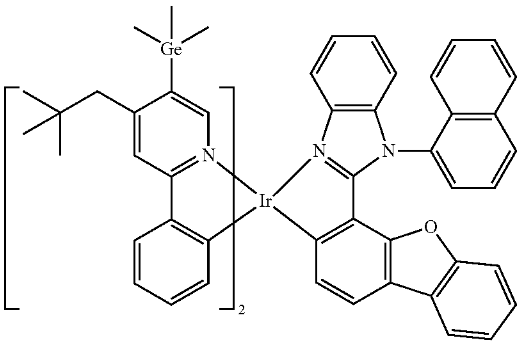
761
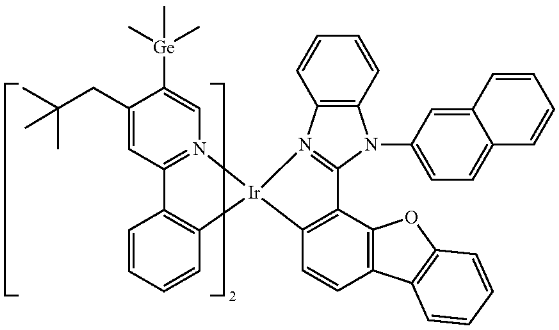
762
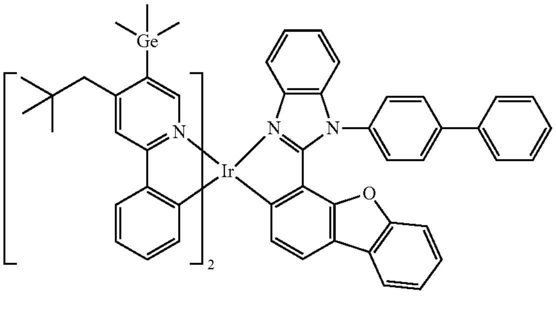

-continued
763
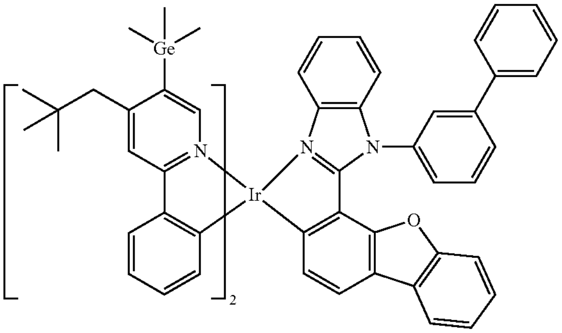
764
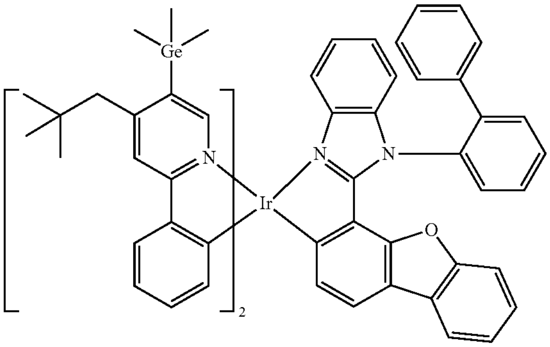
765
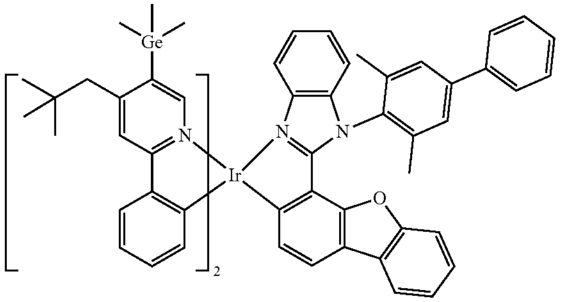
766
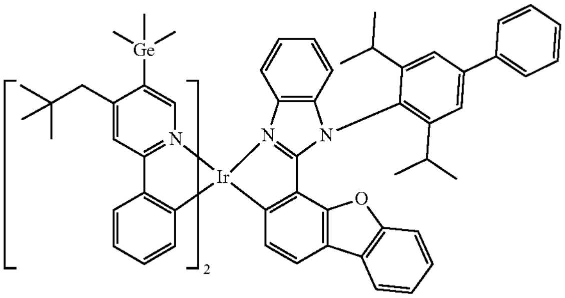
-continued
767
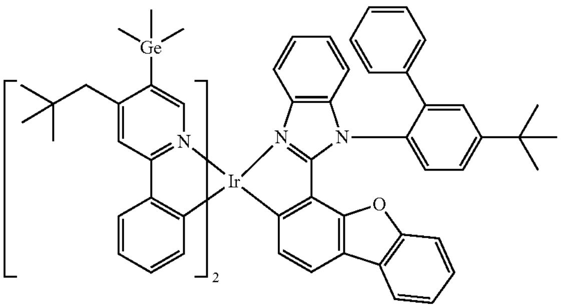
768
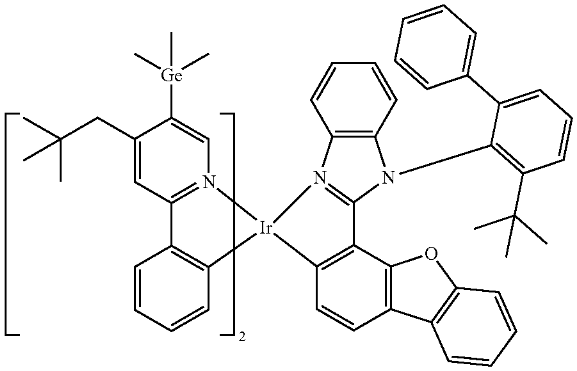
769
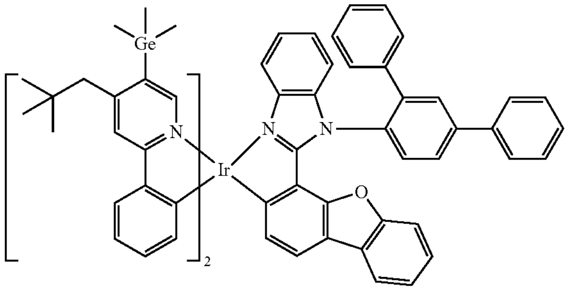
770
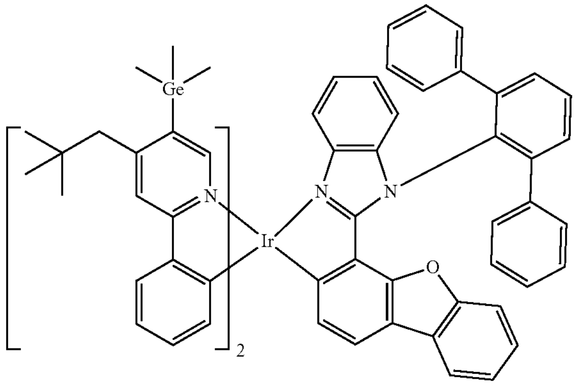

-continued
771
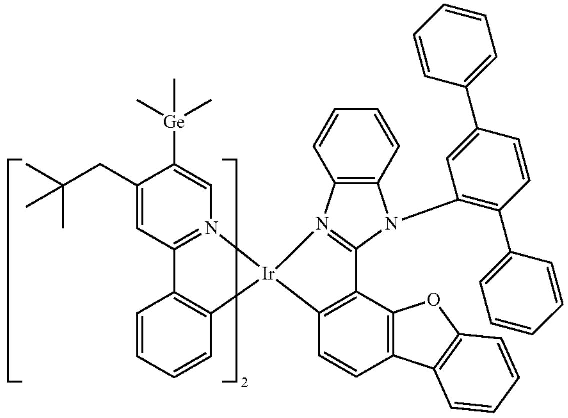
772
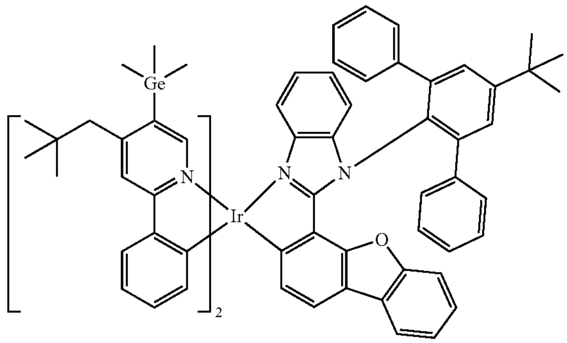
773
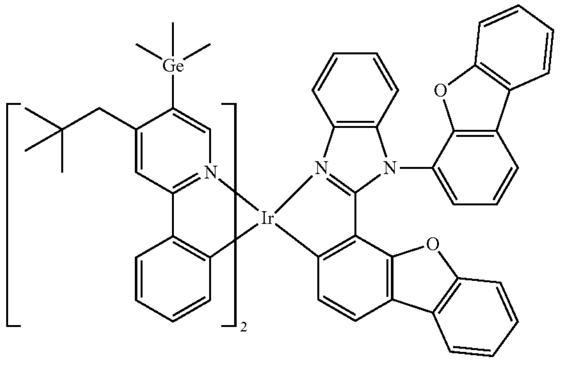
774
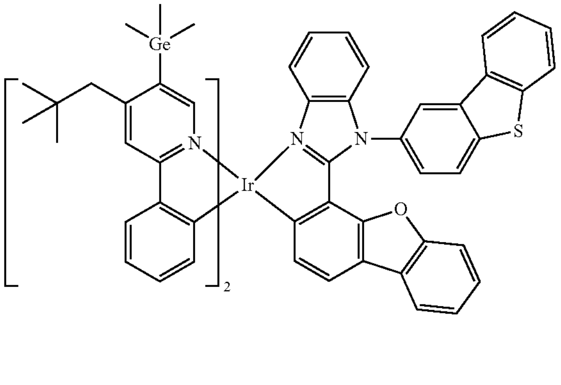
-continued
775
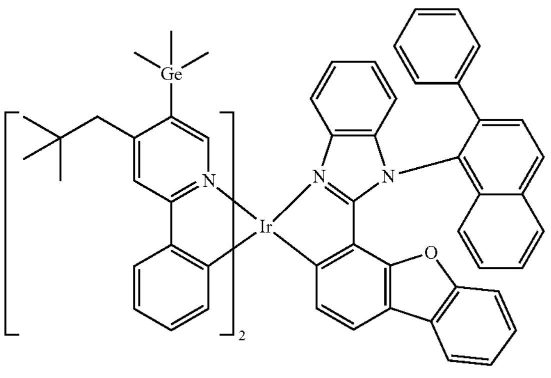
776
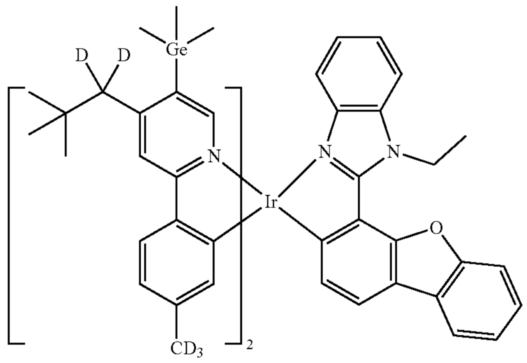
777
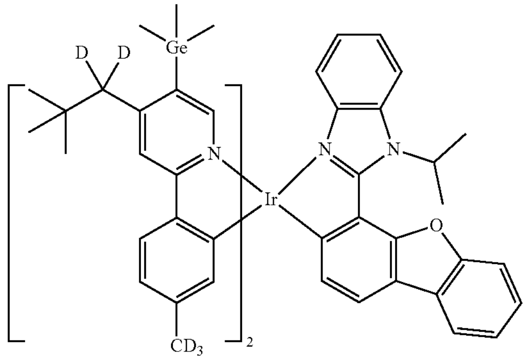
778
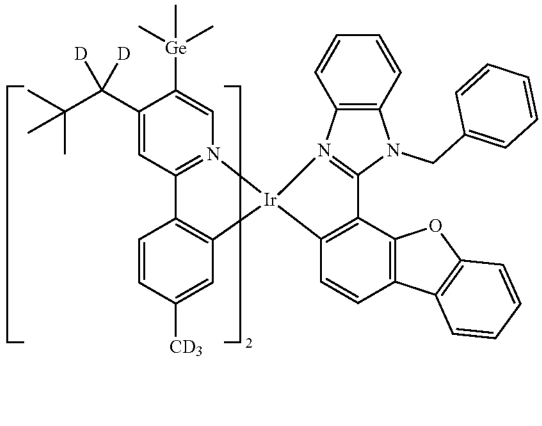

-continued
779
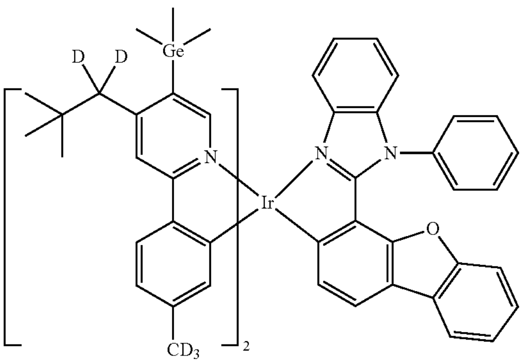
780
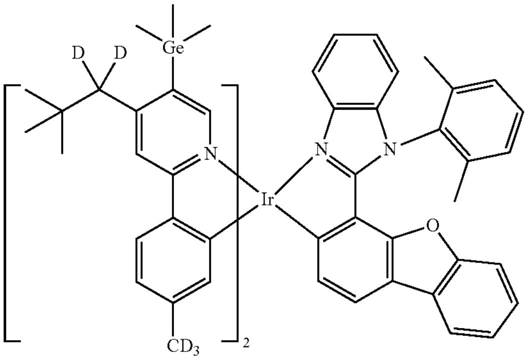
781
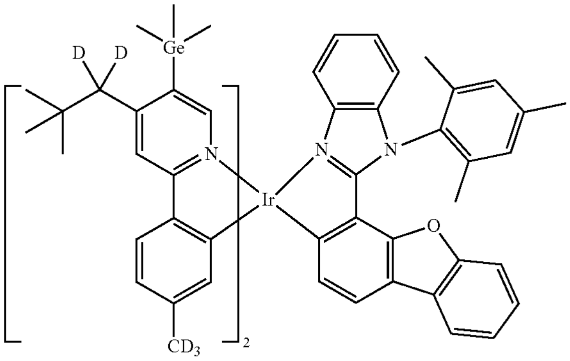
782
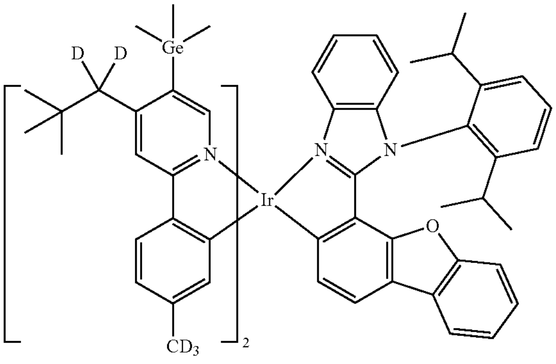
-continued
783
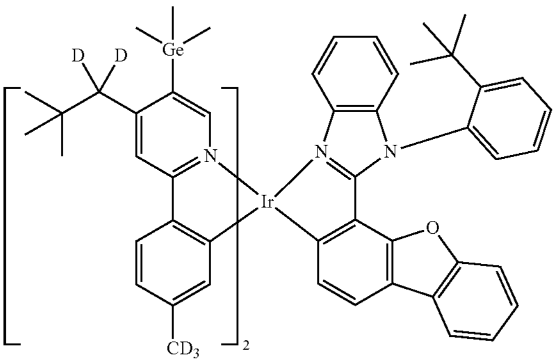
784
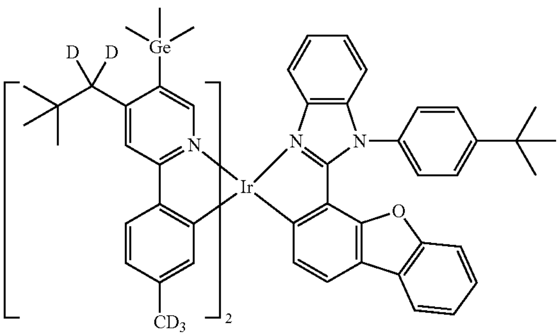
785
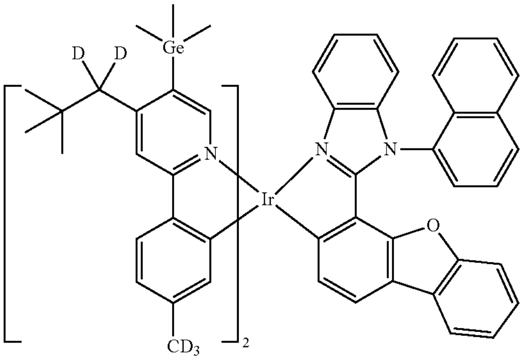
786
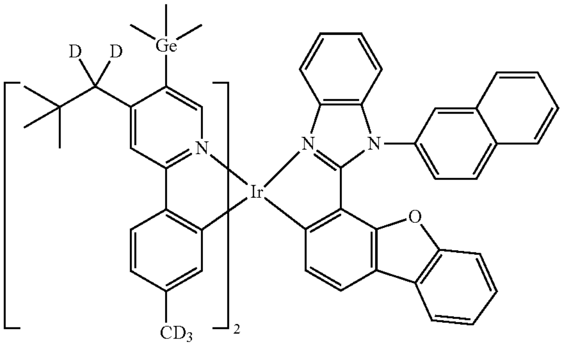

-continued
787
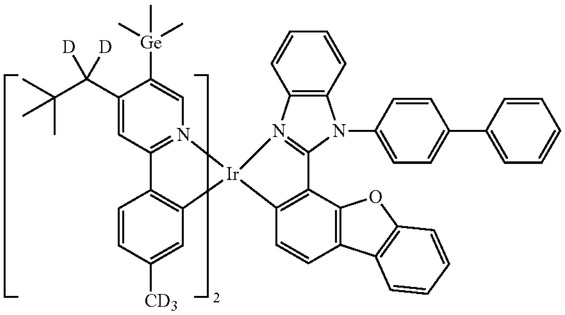
788
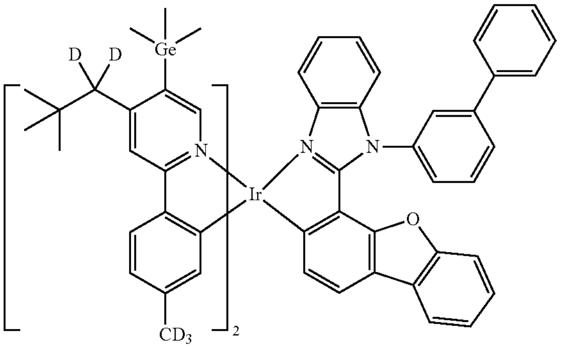
789
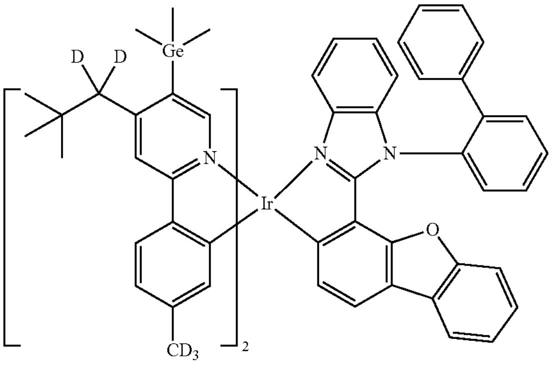
790
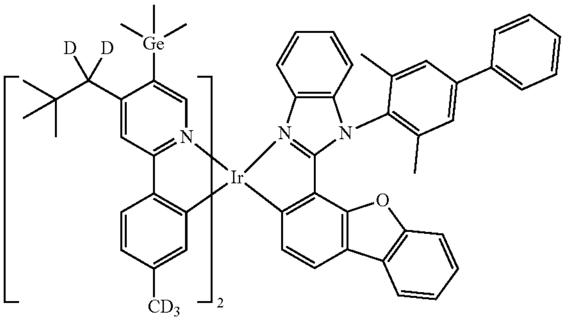
-continued
791
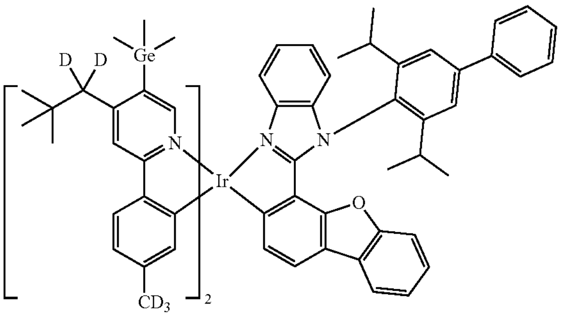
792
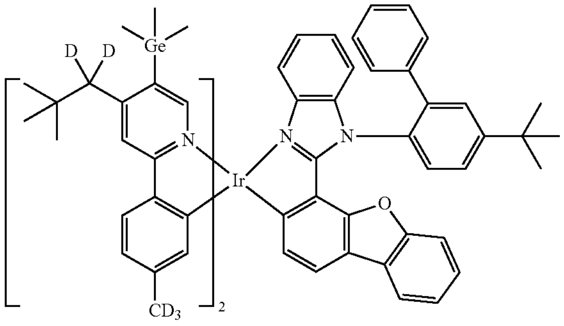
793
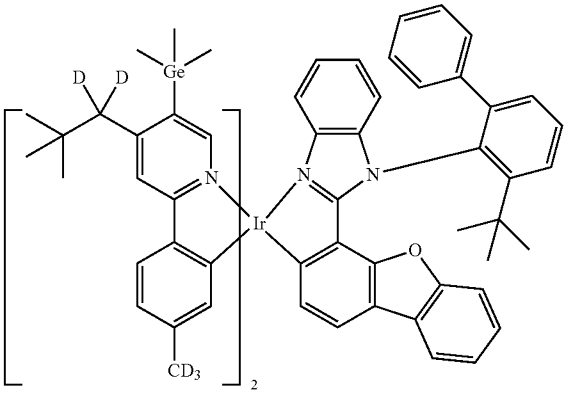
794
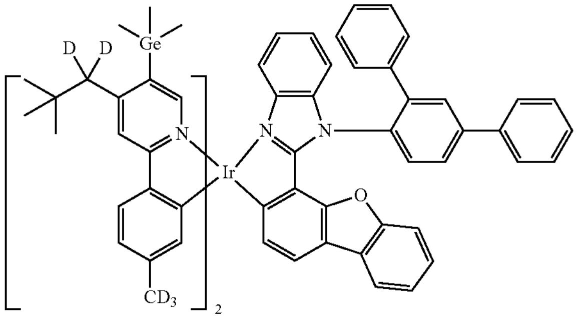

-continued
795
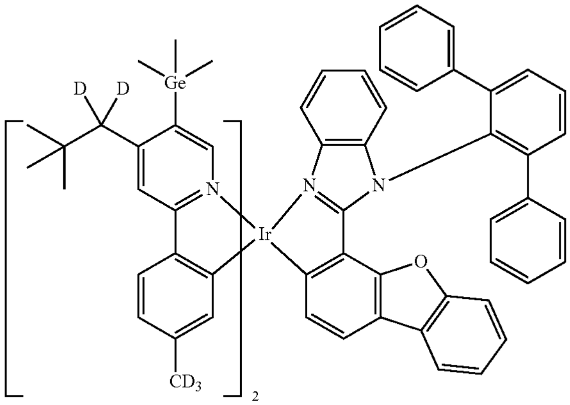
796
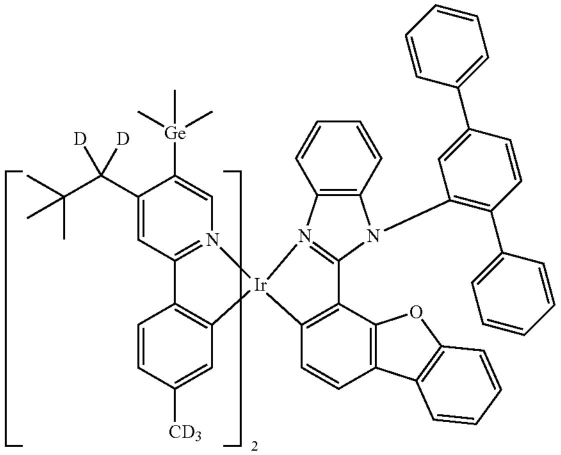
797
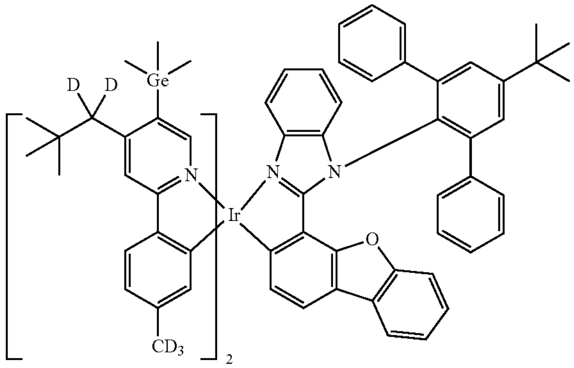
-continued
798
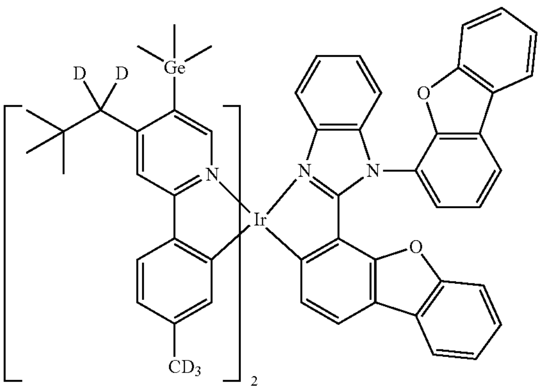
799
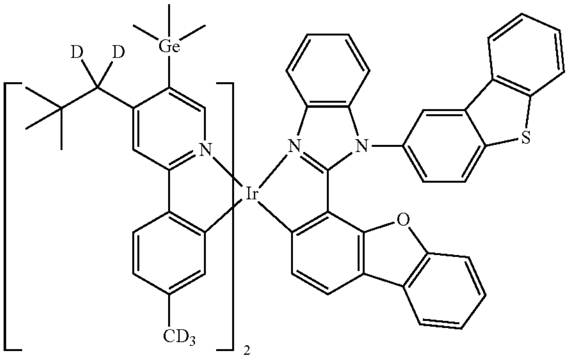
800
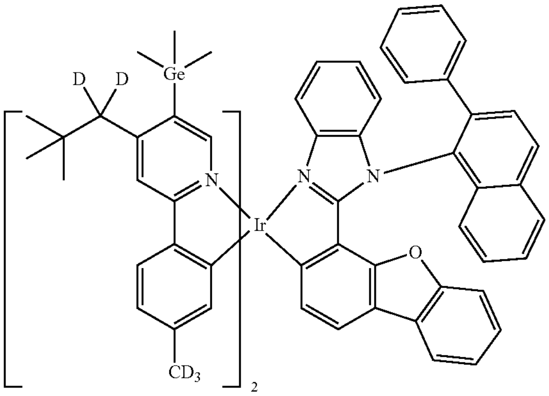
801
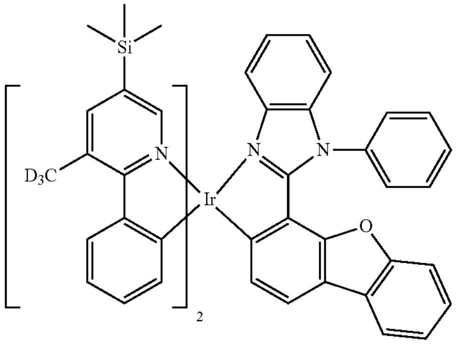

-continued
802
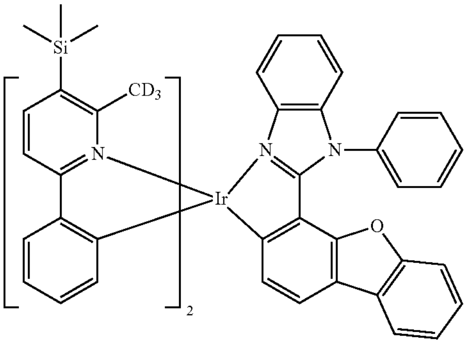
803
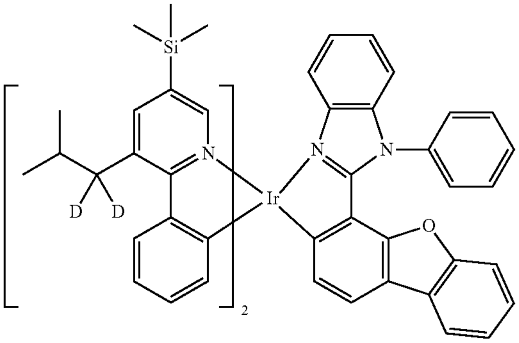
804
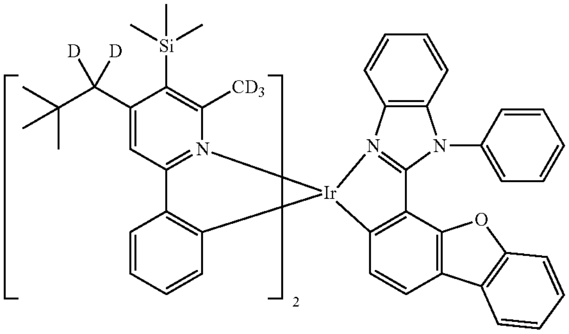
805
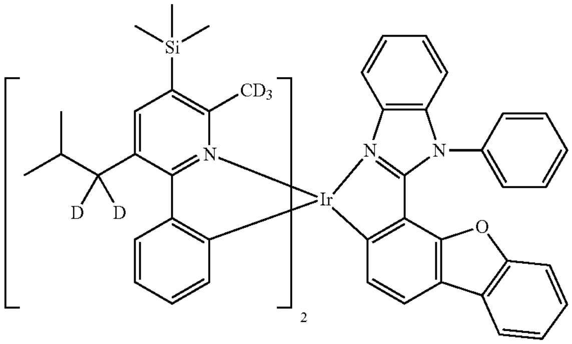
-continued
806
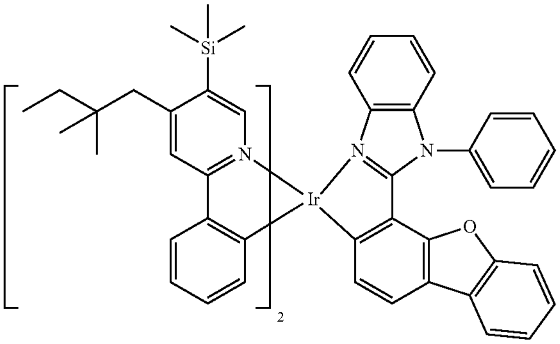
807
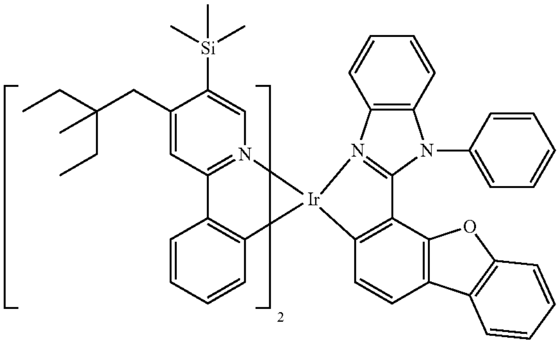
808
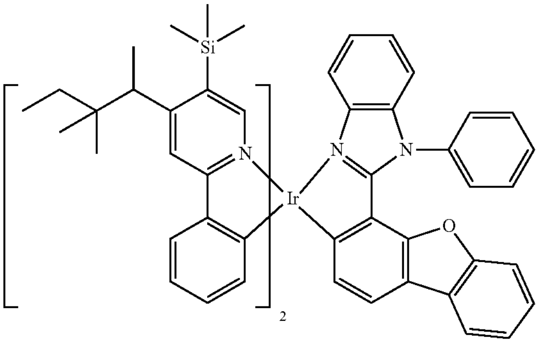
809
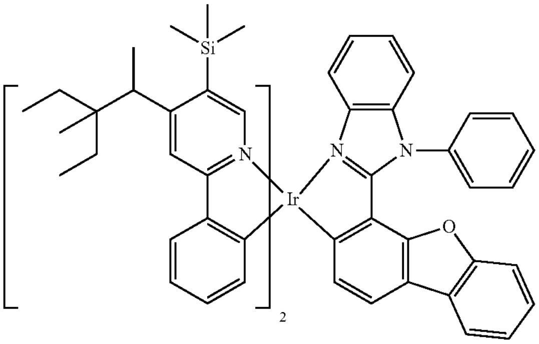

810
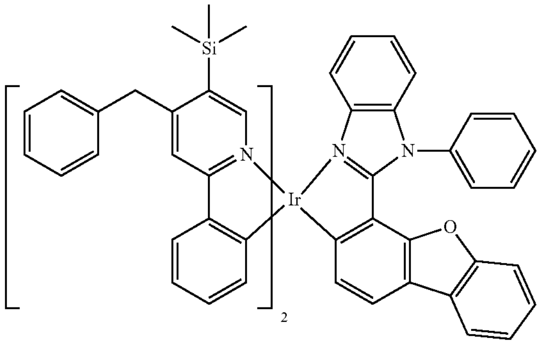
811
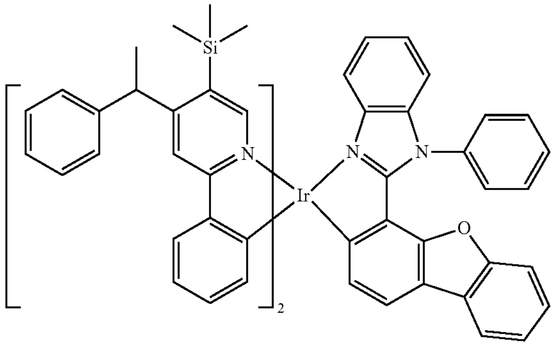
812
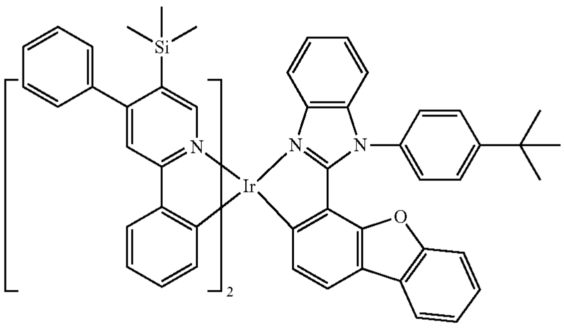
813
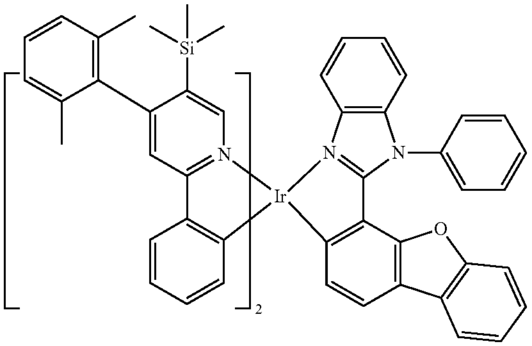
-continued
814
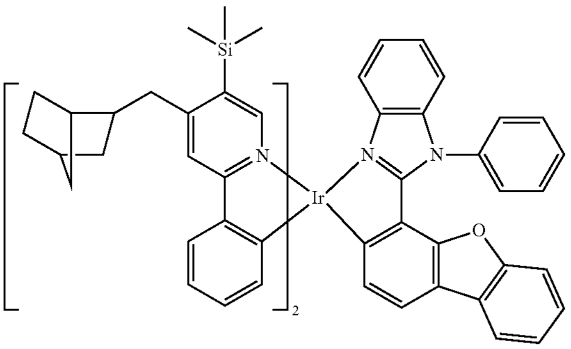
815
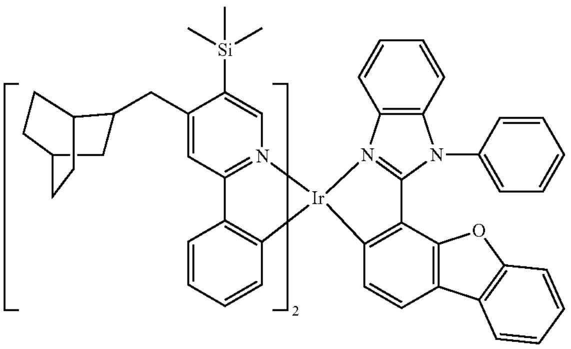
816
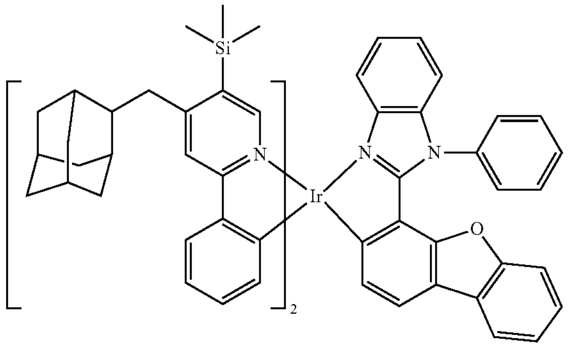
817
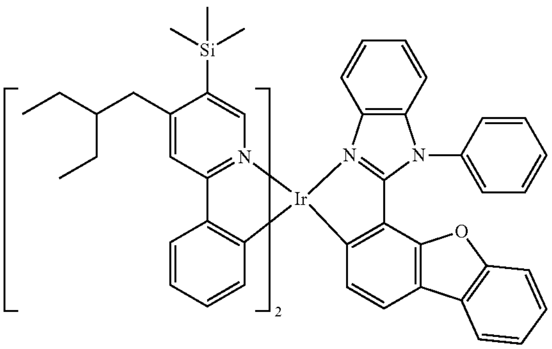

-continued
818
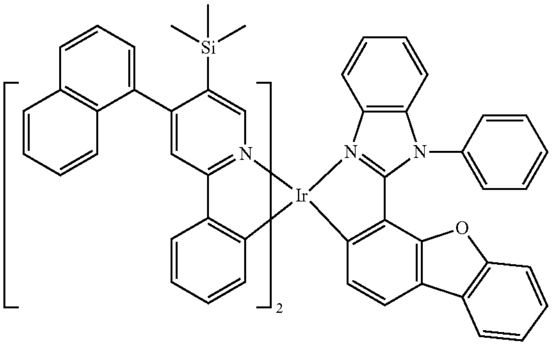
819
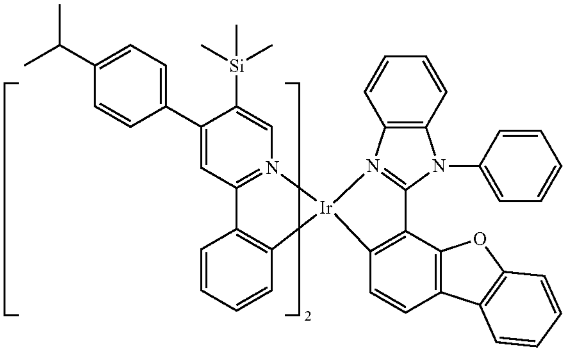
820
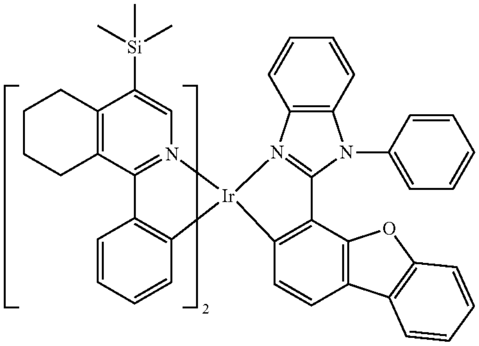
821
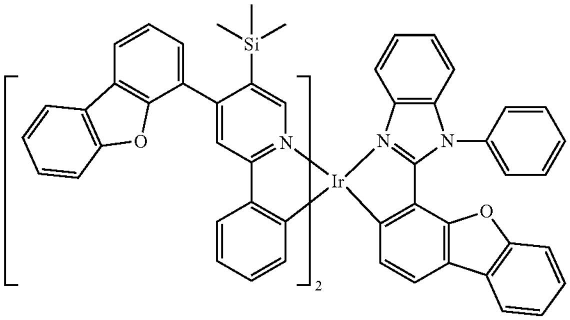
-continued
822
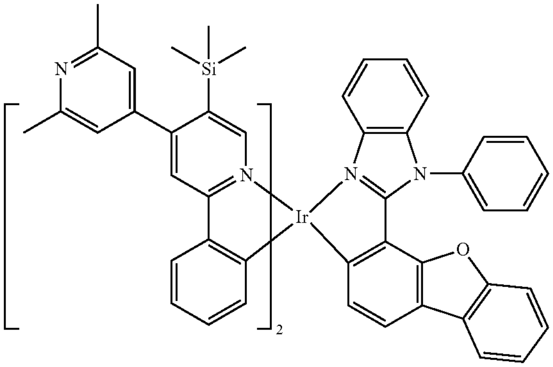
823
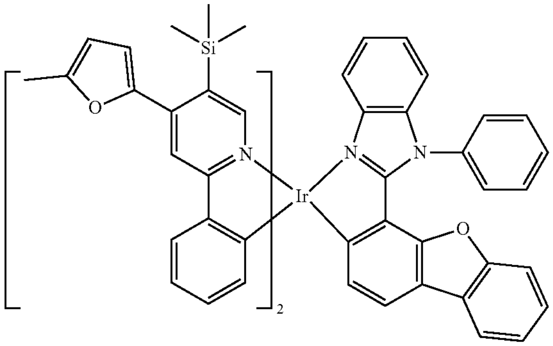
824
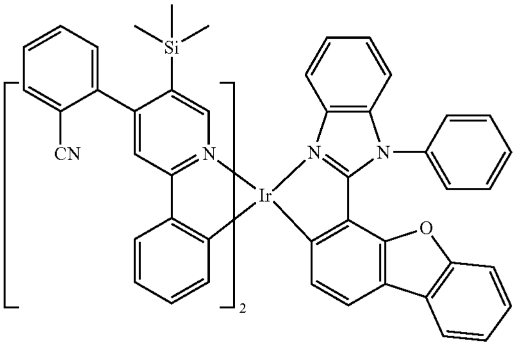
825
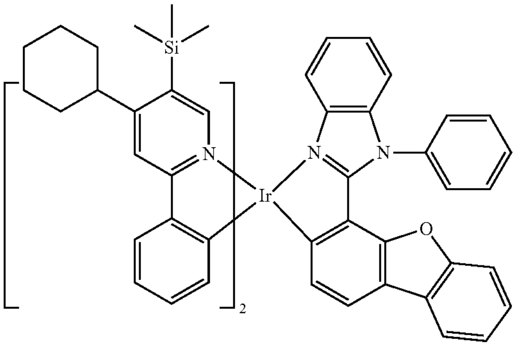

-continued
826
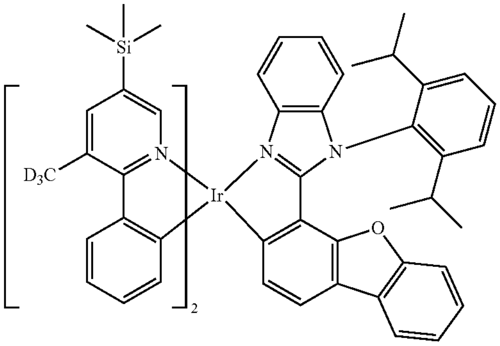
827
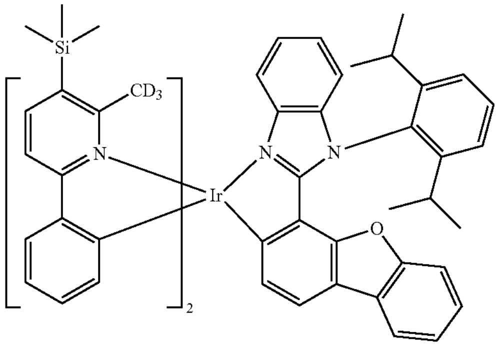
828
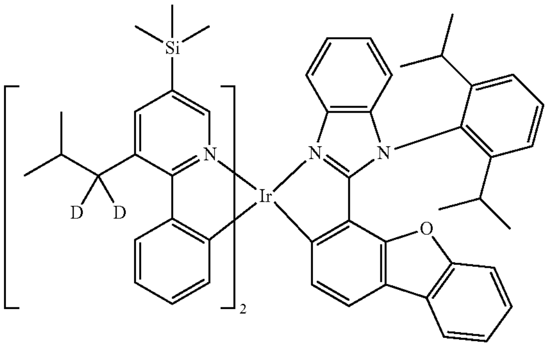
829
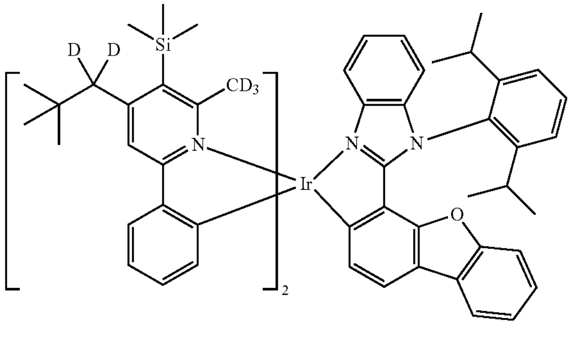
-continued
830
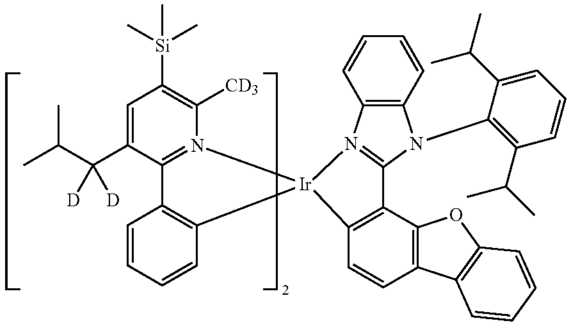
831
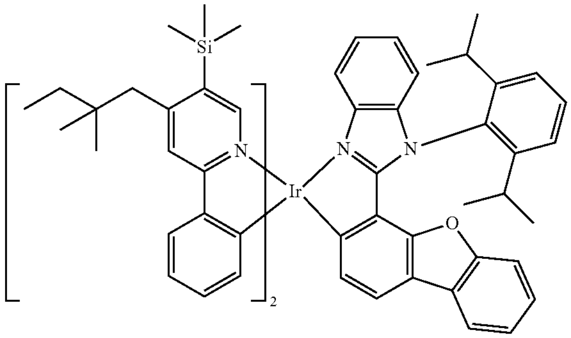
832
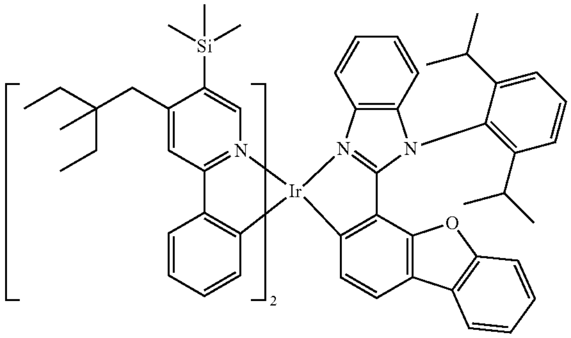
833
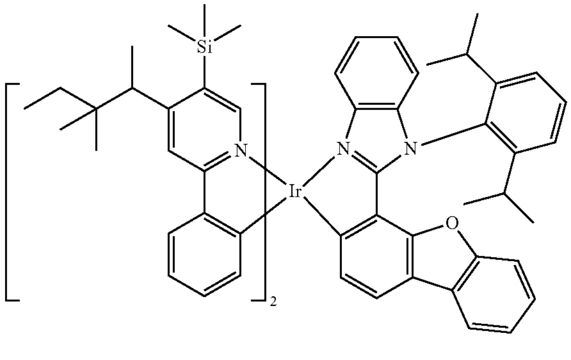

-continued
834
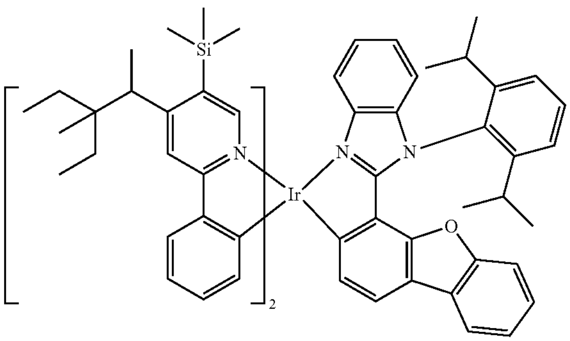
835
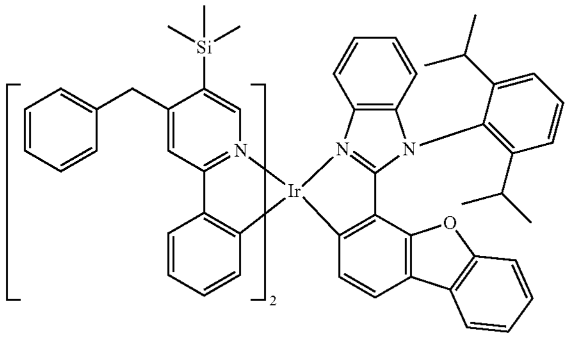
836
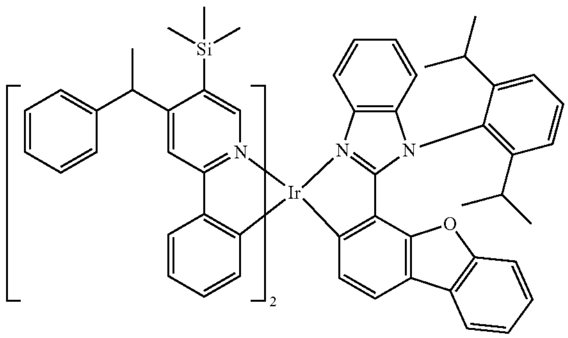
837
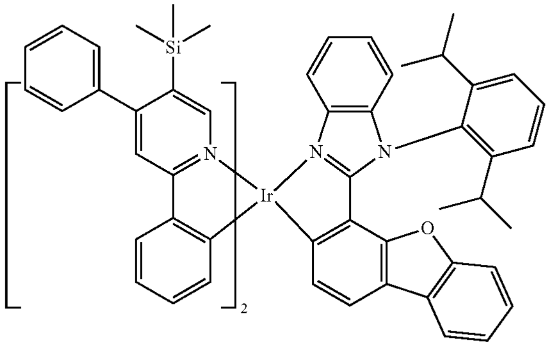
-continued
838
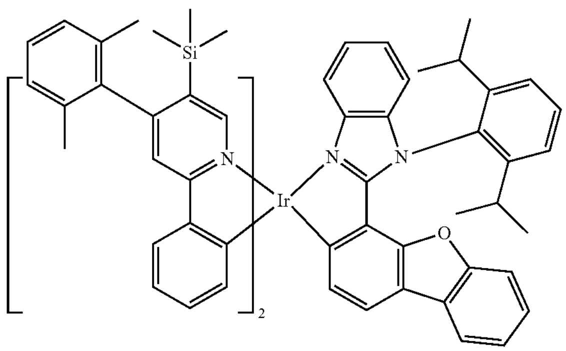
839
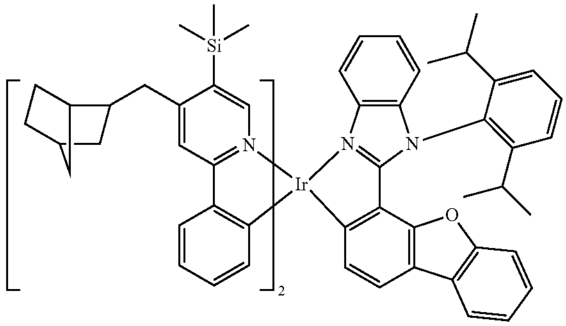
840
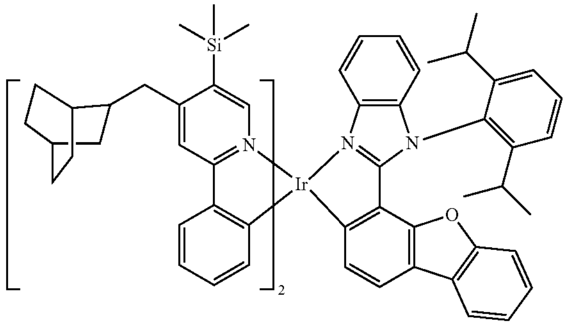
841
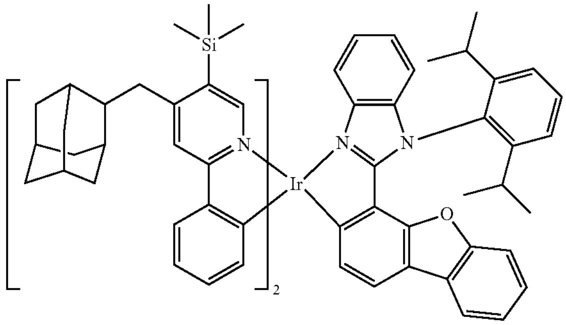

-continued
842
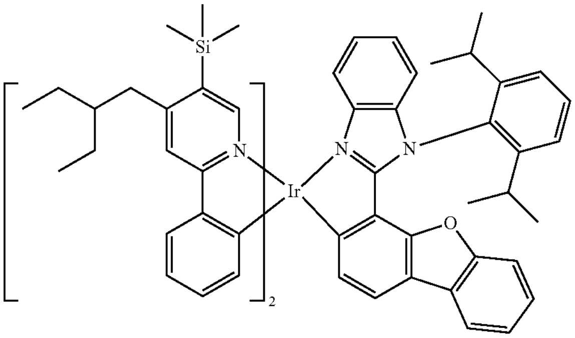
843
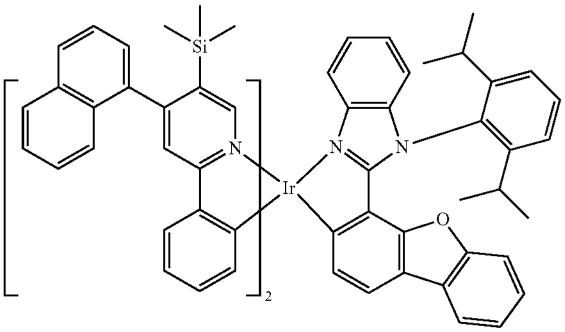
844
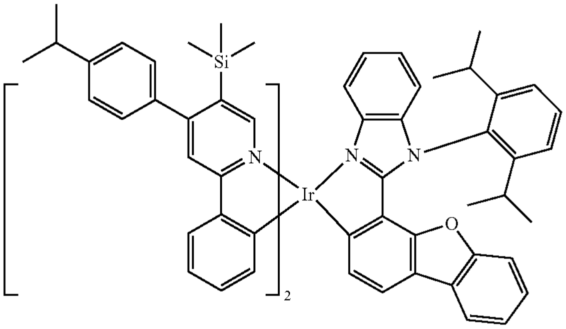
845
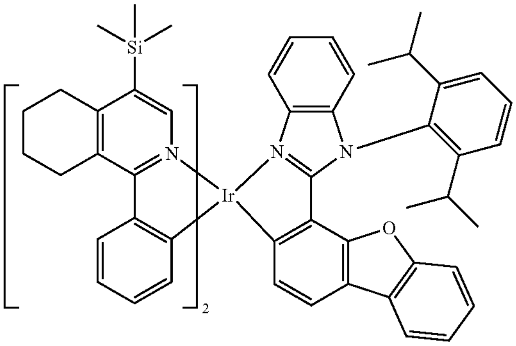
-continued
846
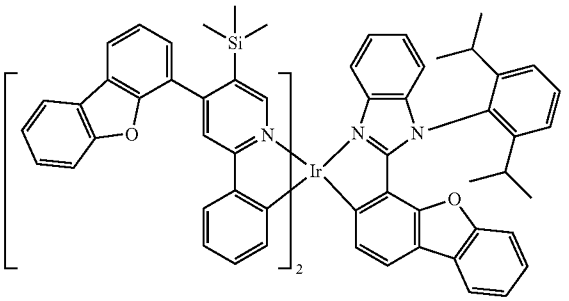
847
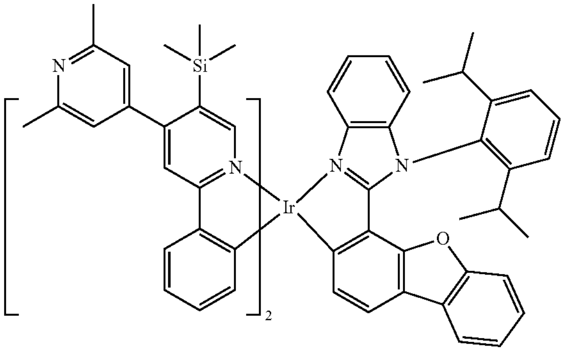
848
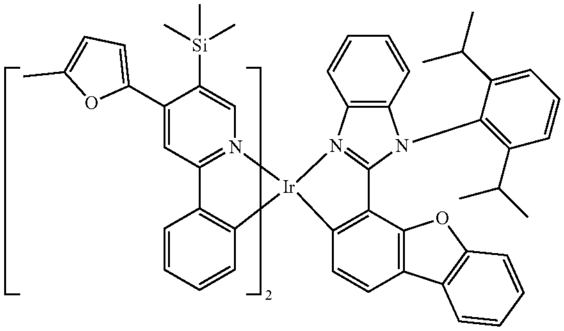
849
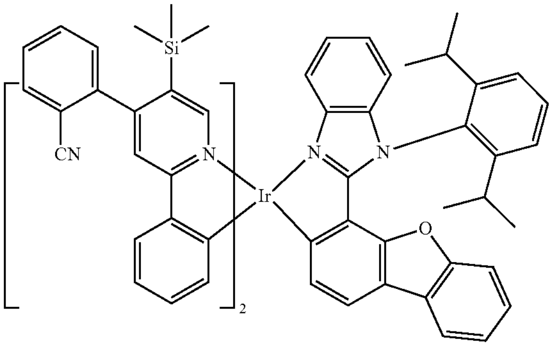

-continued
850
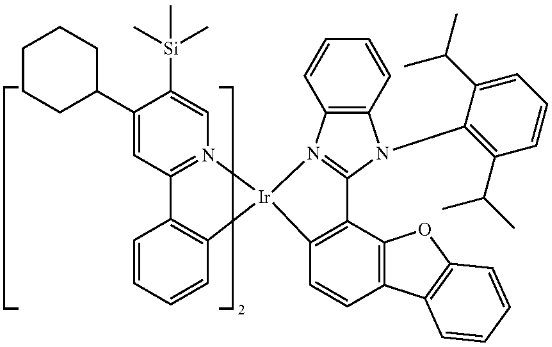
851
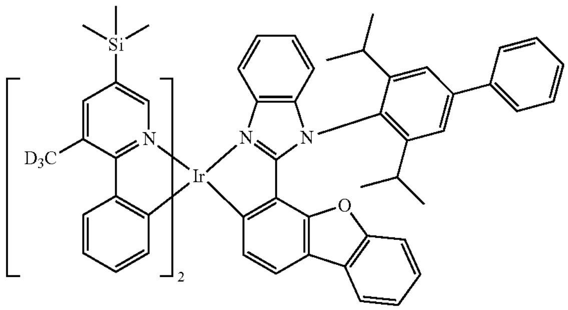
852
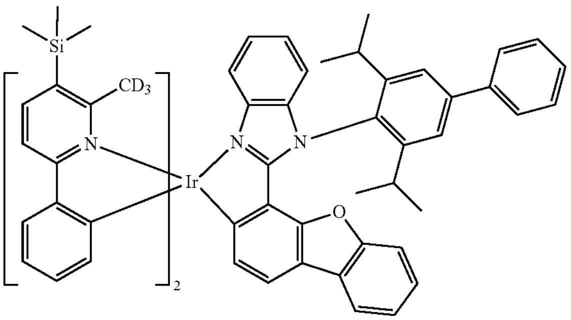
853
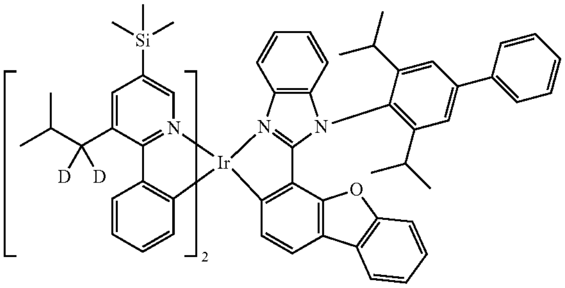
-continued
854
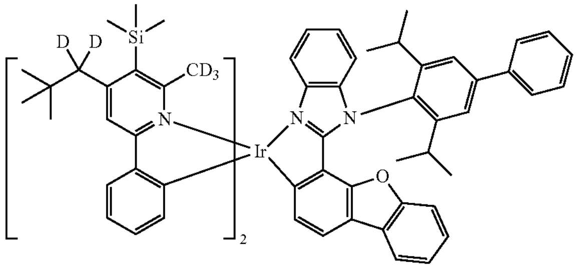
855
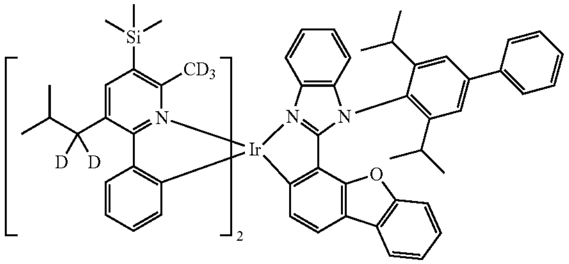
856
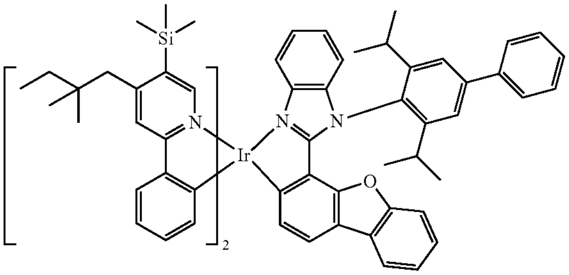
857
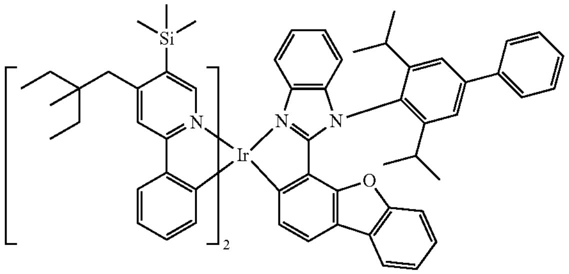
858
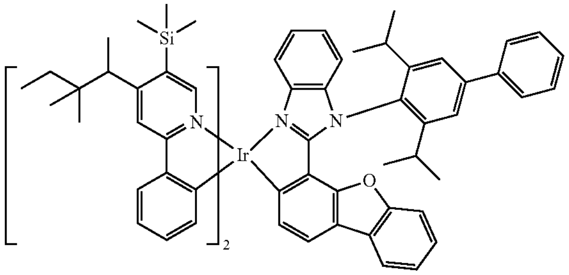

-continued
859
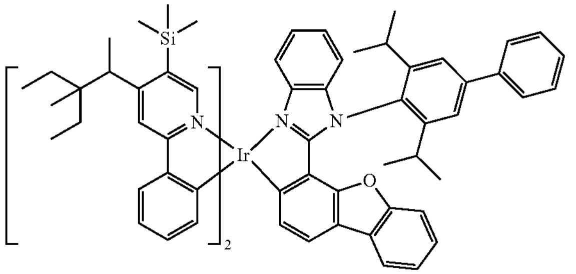
860
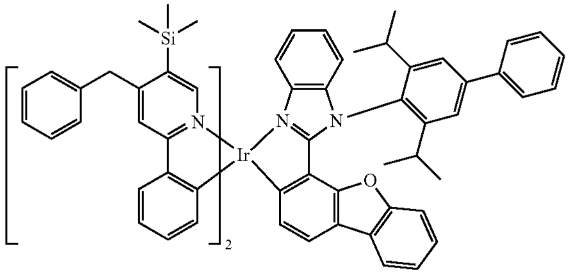
861
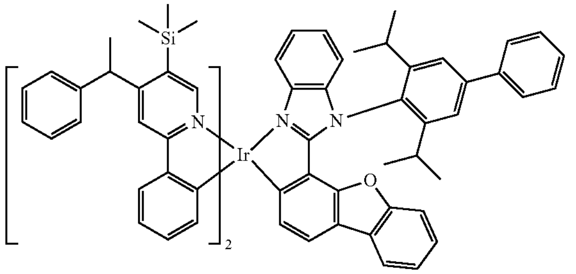
862
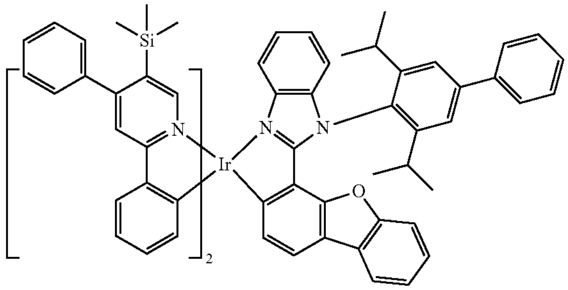
863
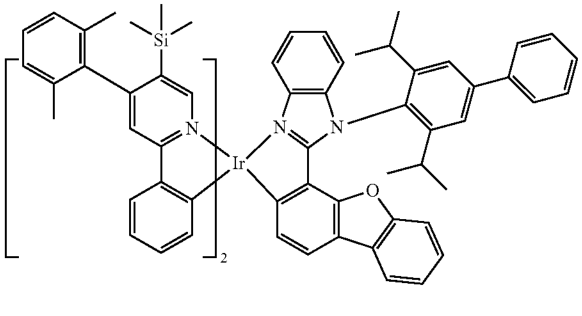
-continued
864
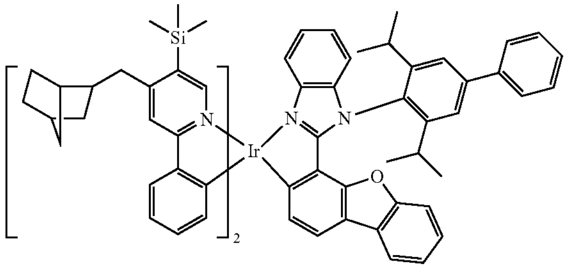
865
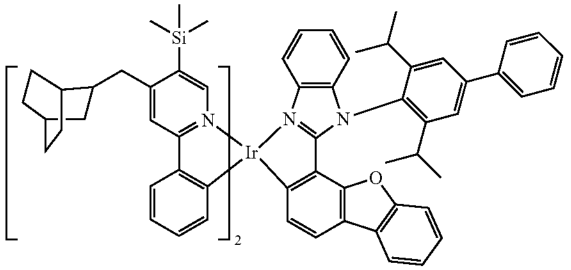
866
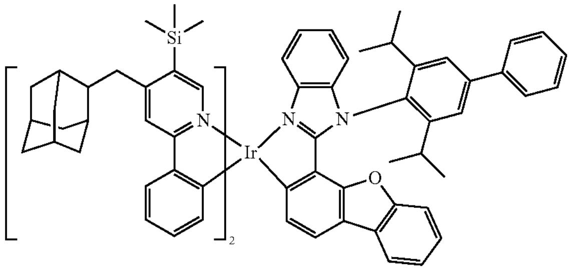
867
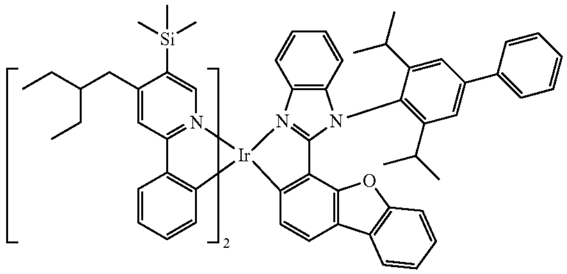
868
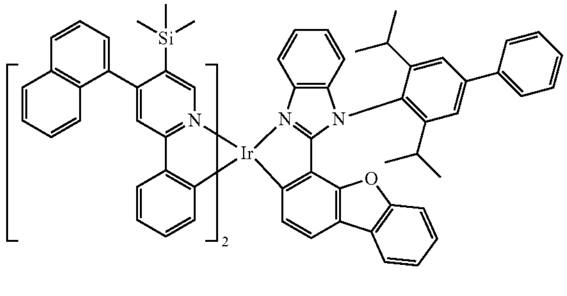

-continued
869
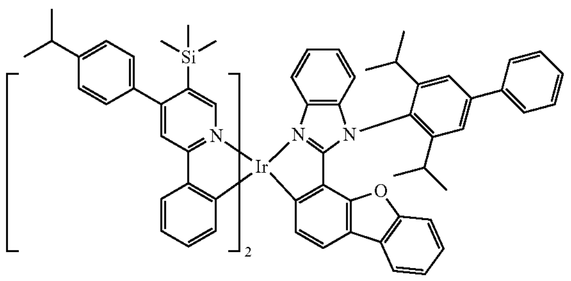
870
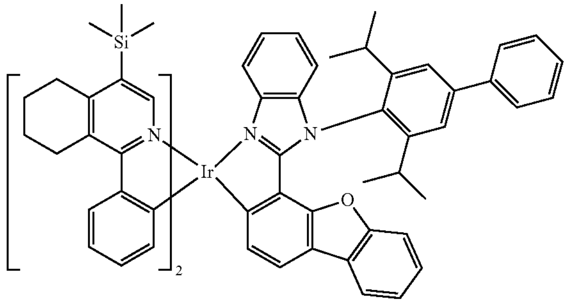
871
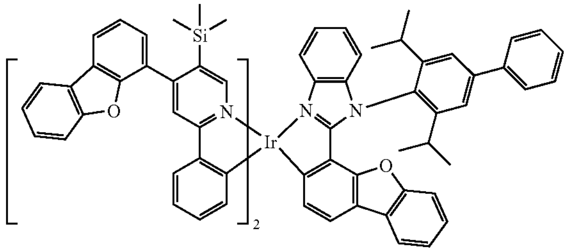
872
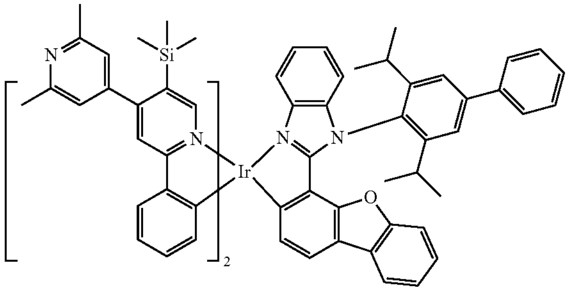
873
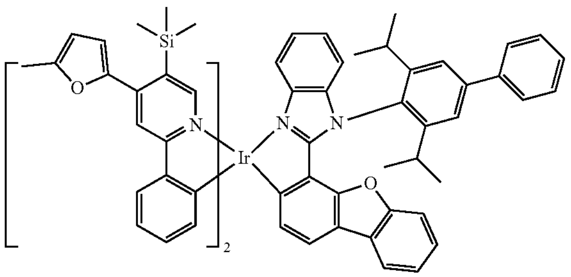
874
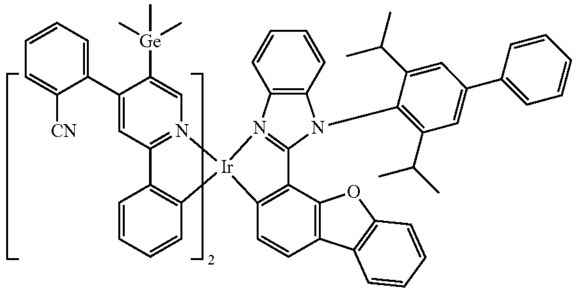
875
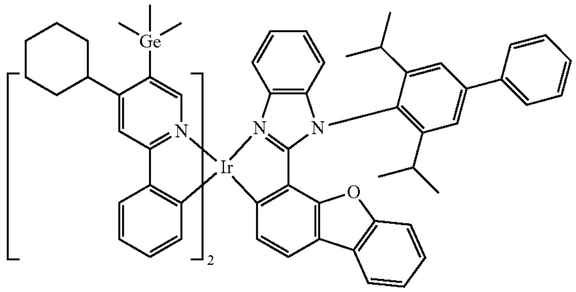
876
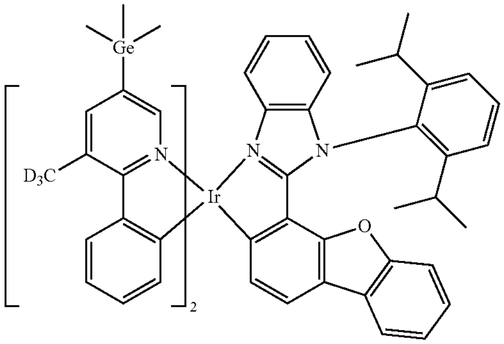
877
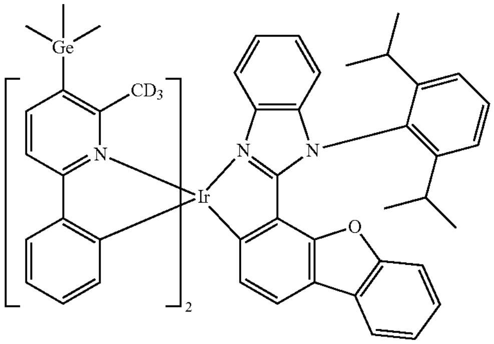

-continued
878
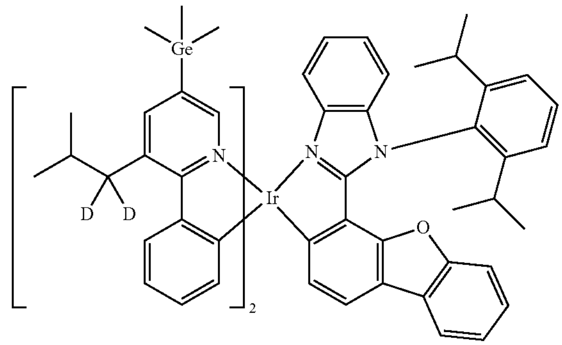
879
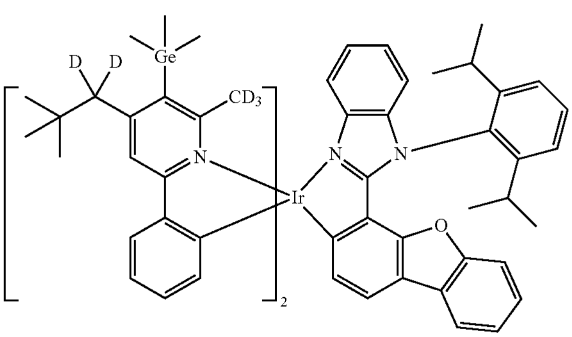
880
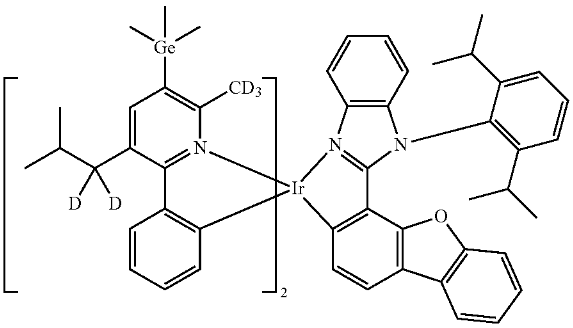
881
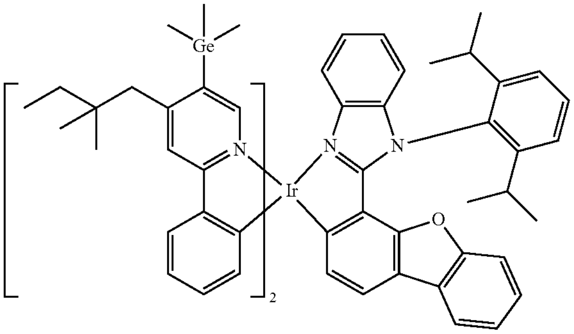
-continued
882
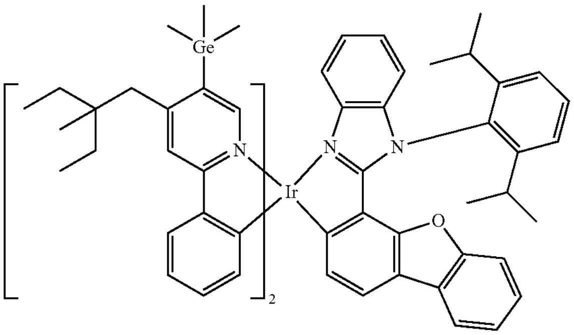
883
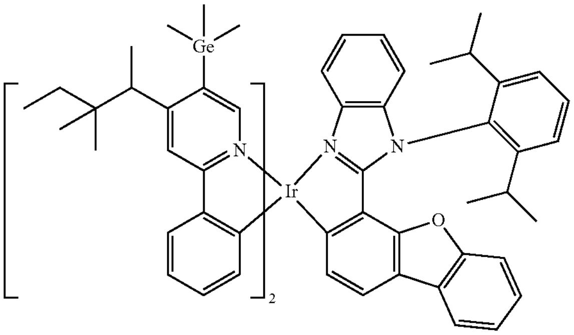
884
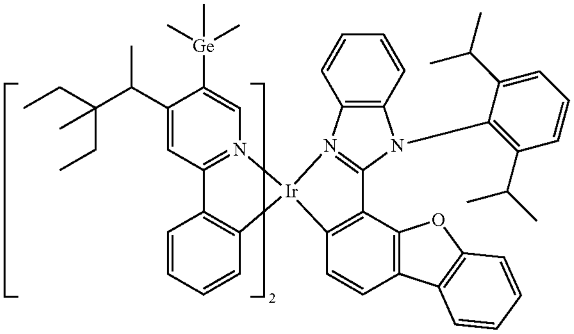
885
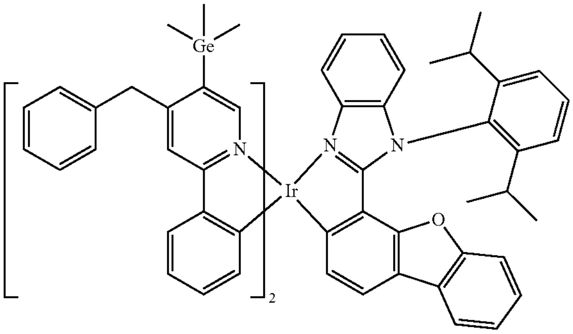

-continued
886
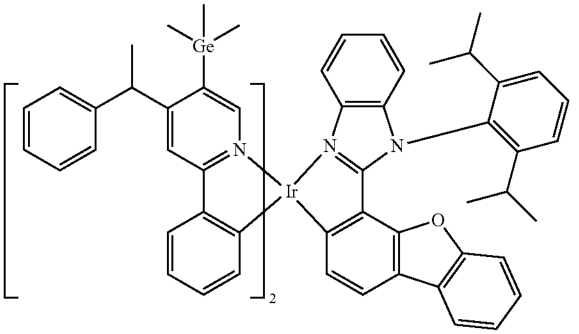
887
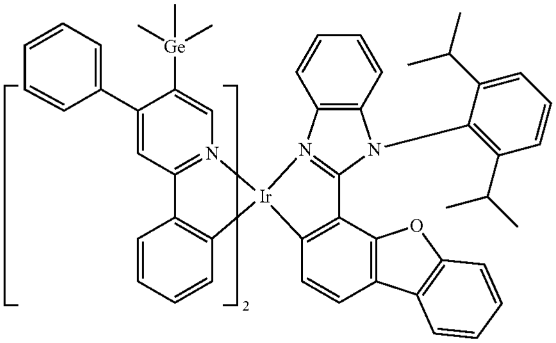
888
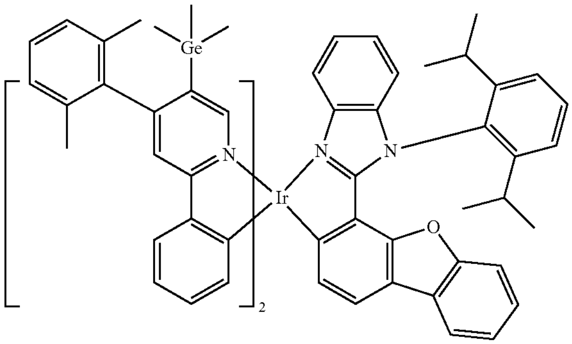
889
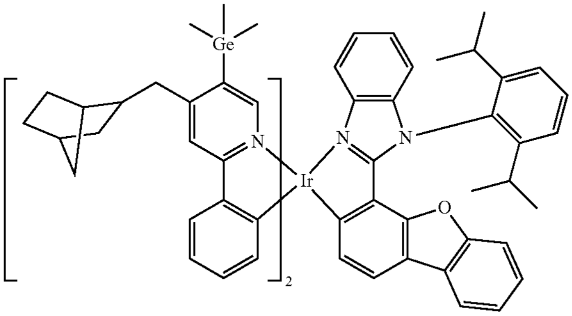
-continued
890
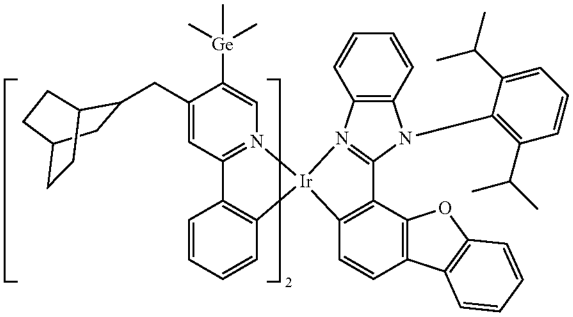
891
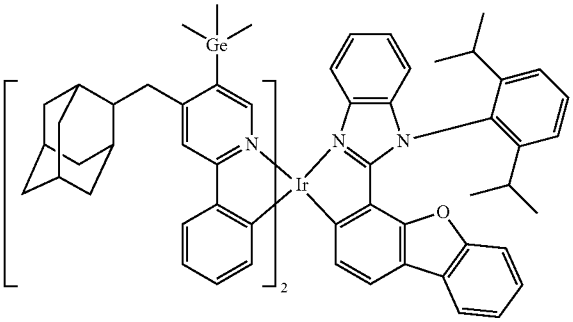
892
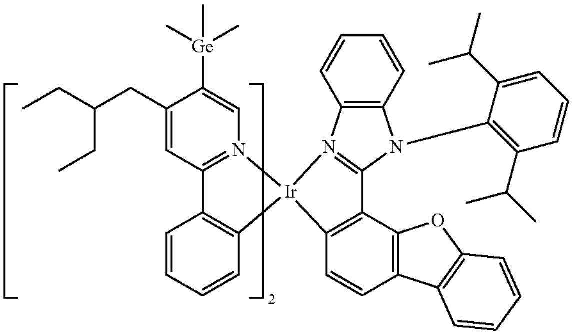
893
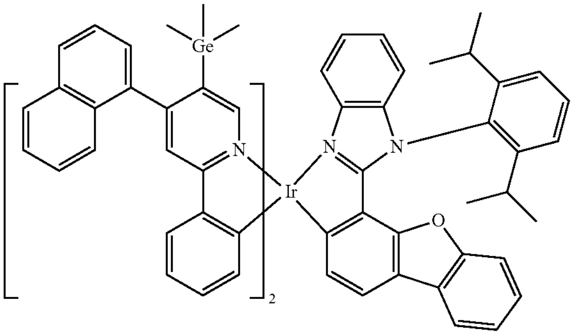

-continued
894
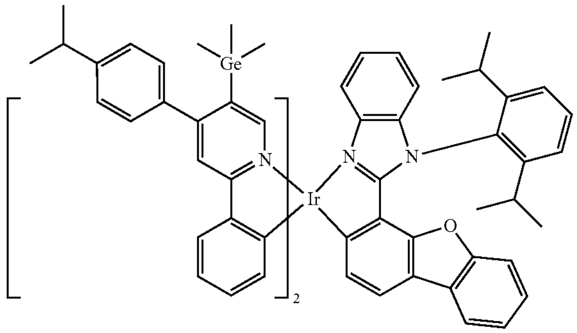
895
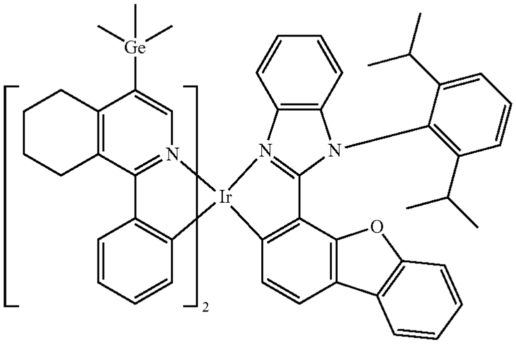
896
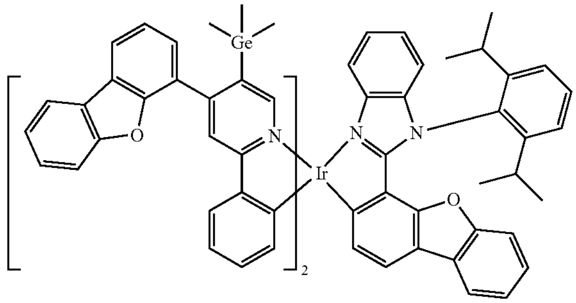
897
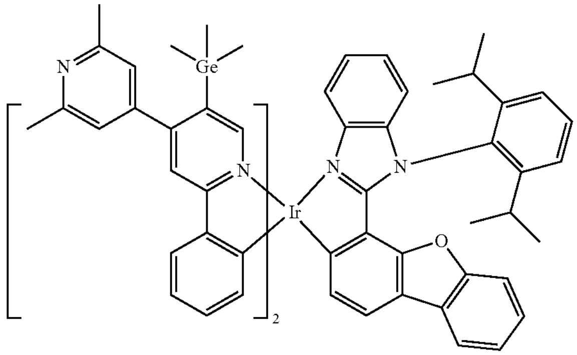
-continued
898
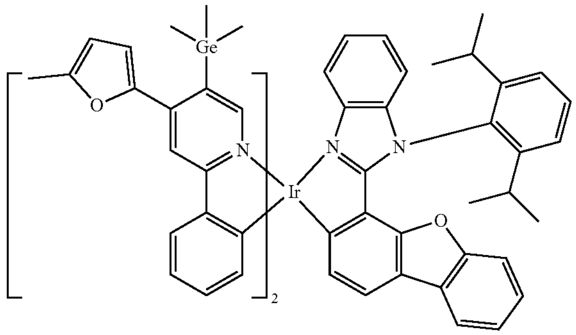
899
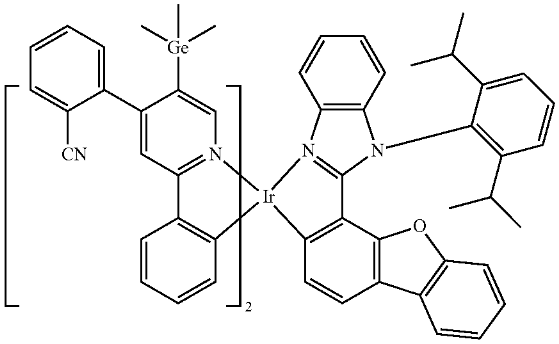
900
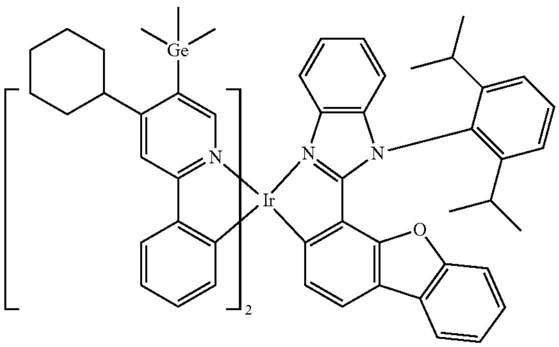
901
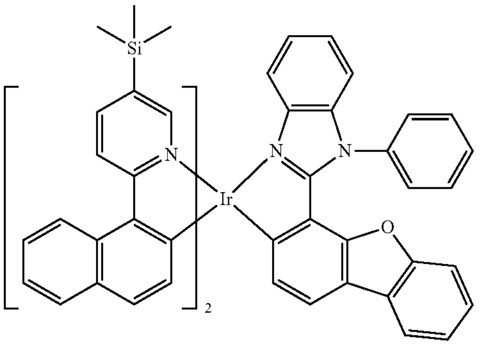

-continued
902
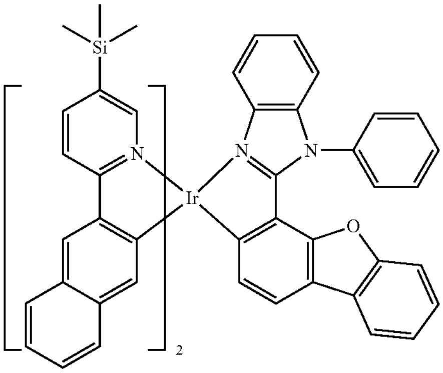
903
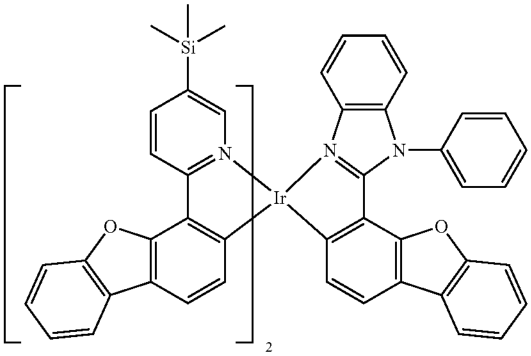
904
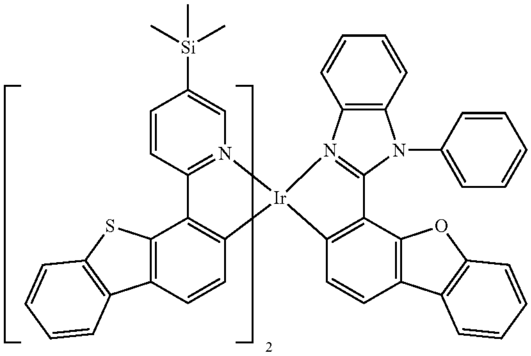
905
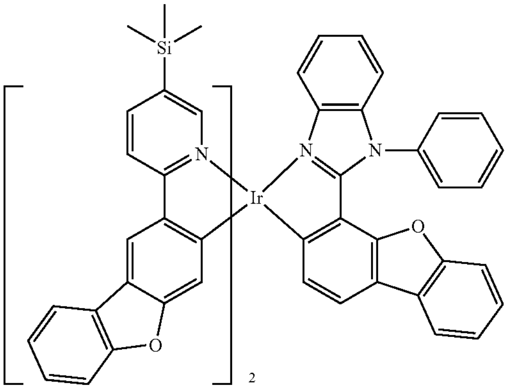
-continued
906
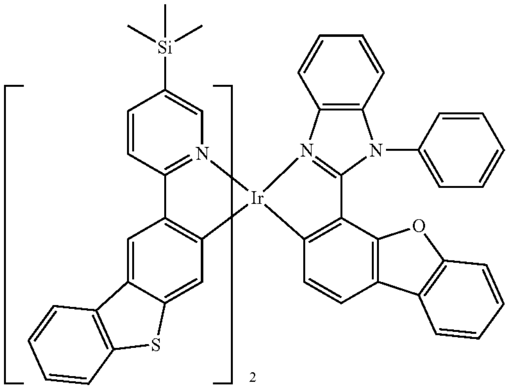
907
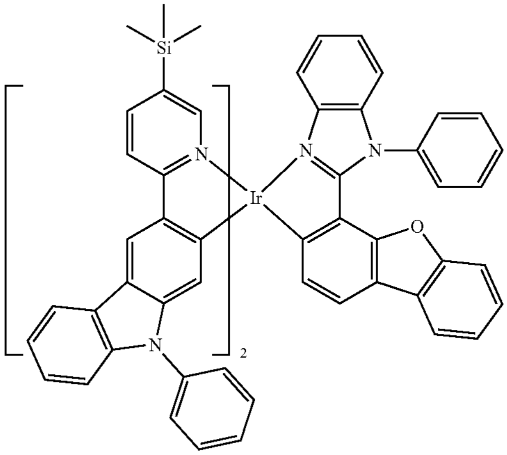
908
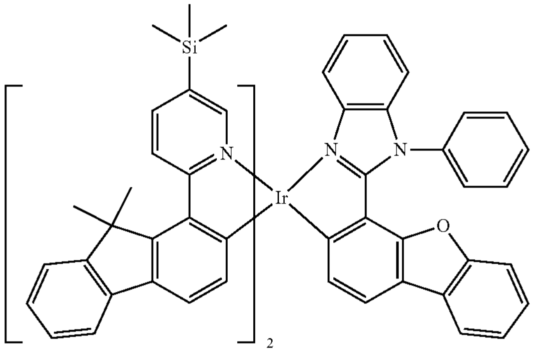
909
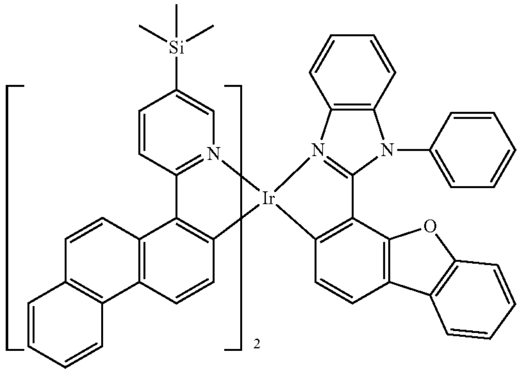

-continued
910
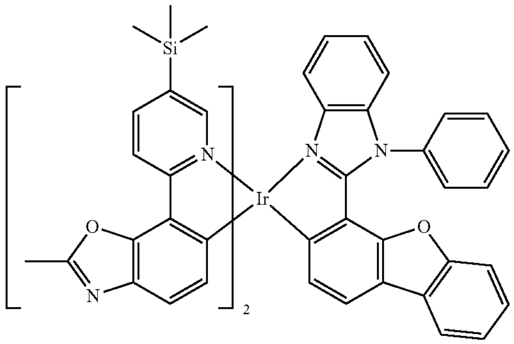
911
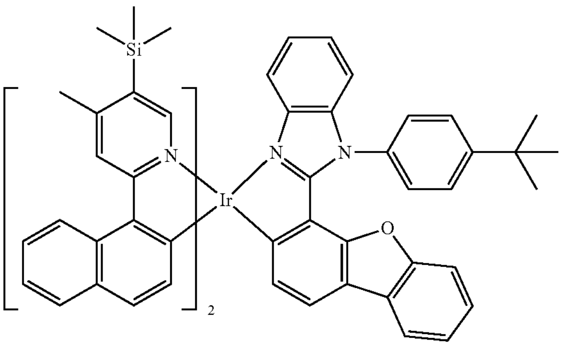
912
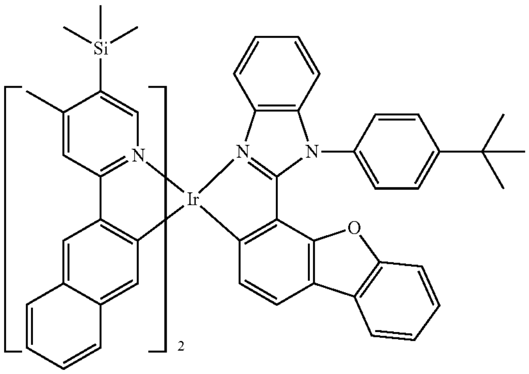
913
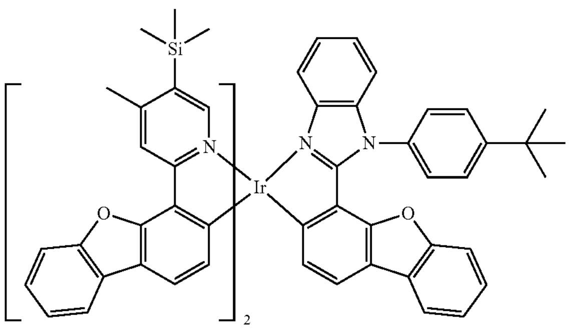
-continued
914
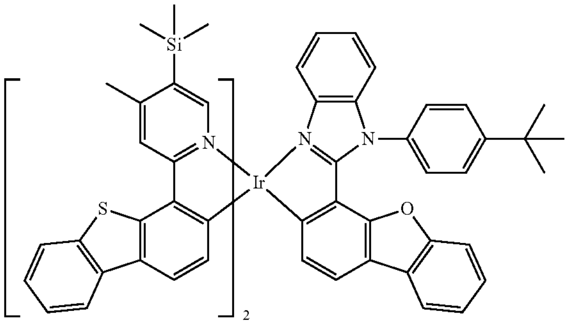
915
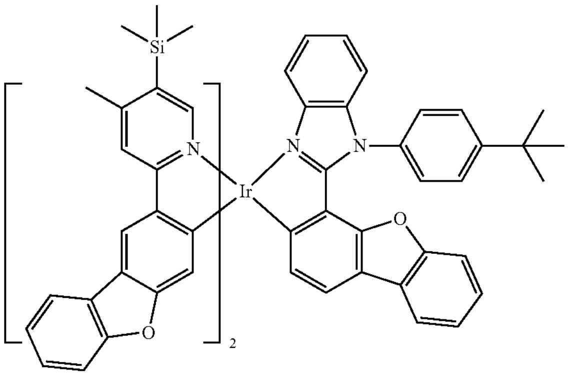
916
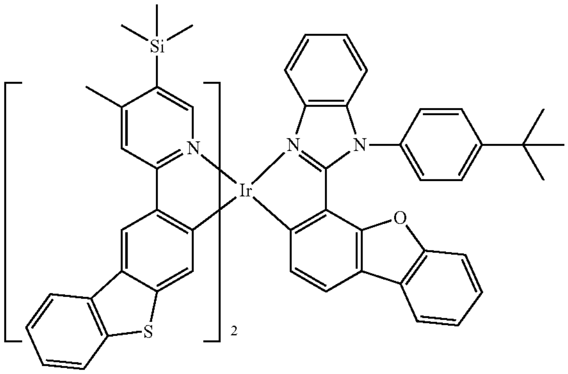
917
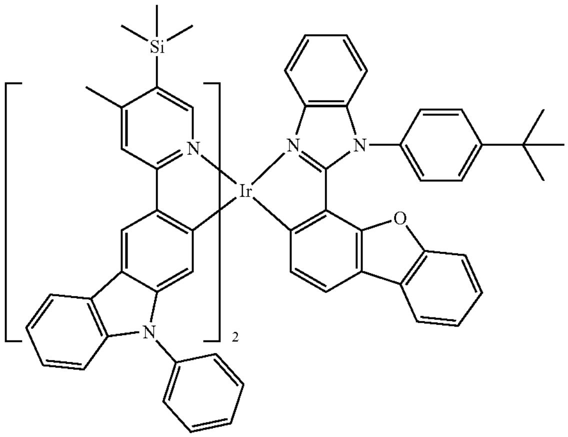

-continued
918
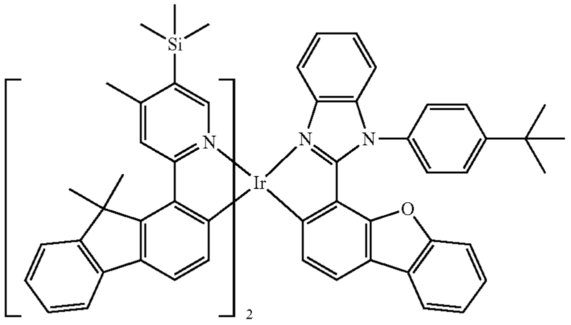
919
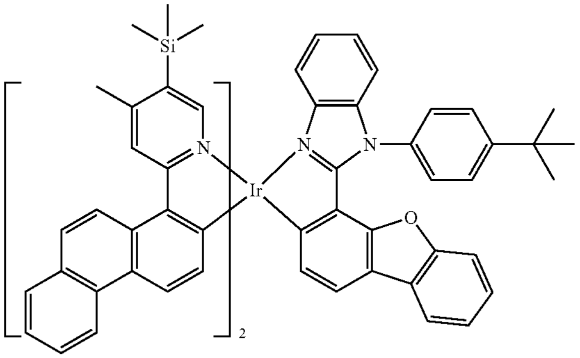
920
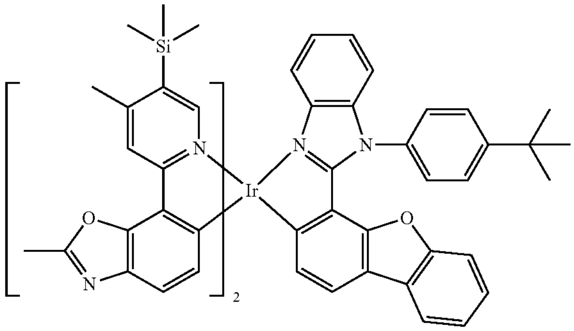
921
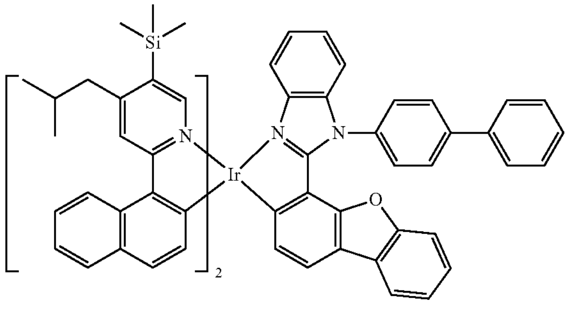
-continued
922
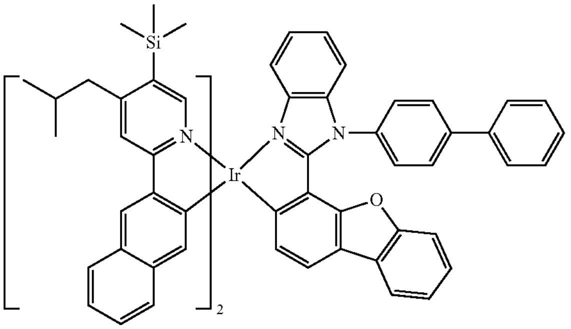
923
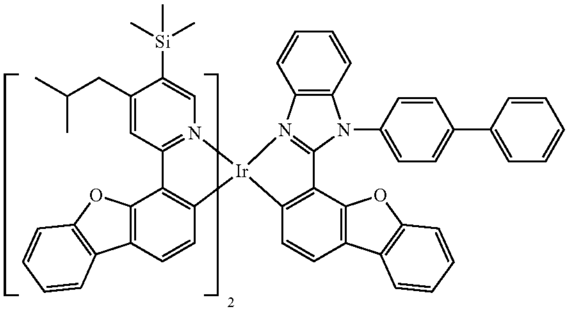
924
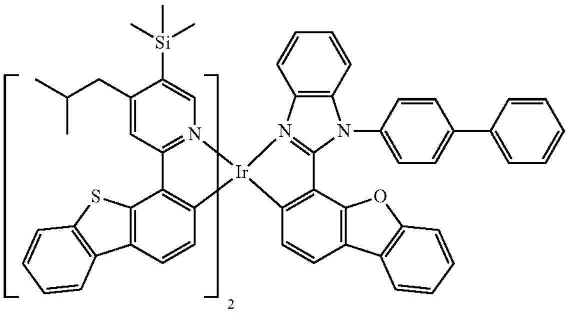
925
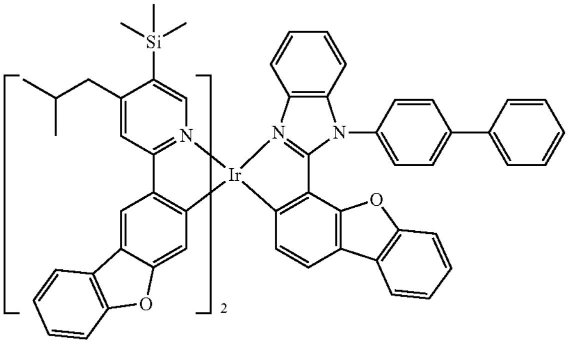

-continued
926
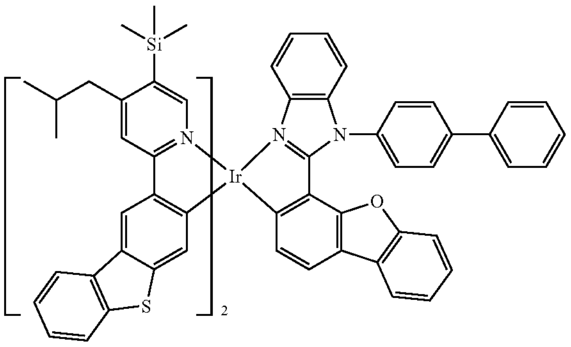
927
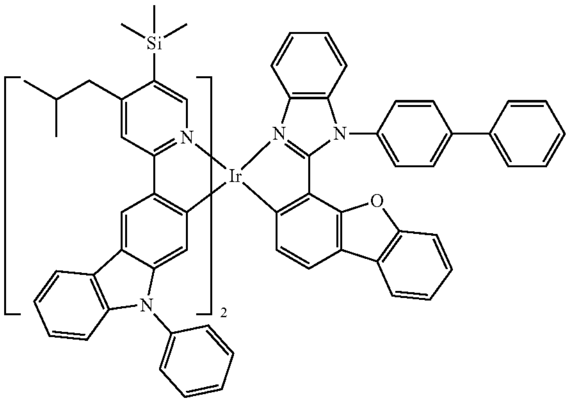
928
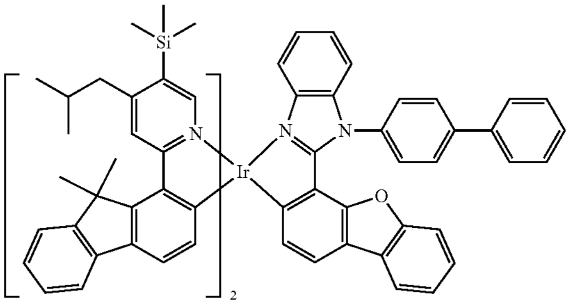
929
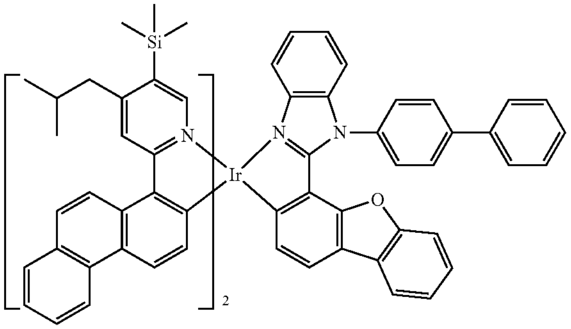
-continued
930
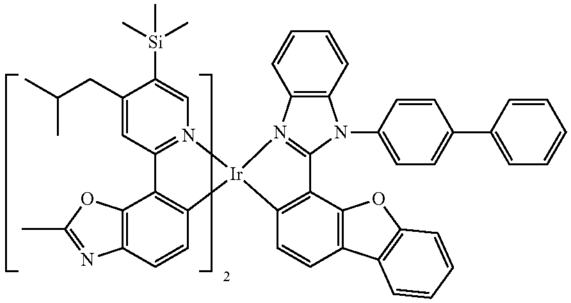
931
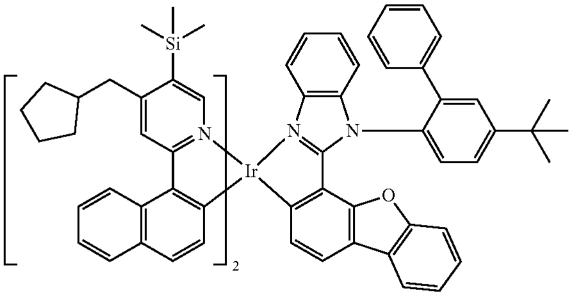
932
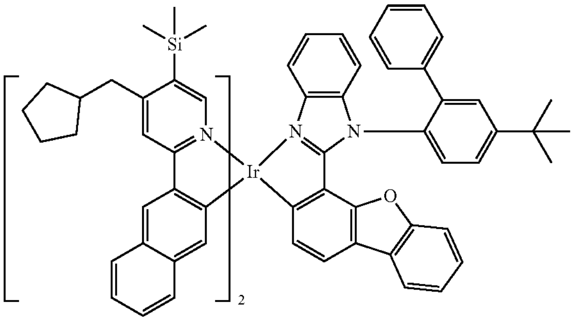
933
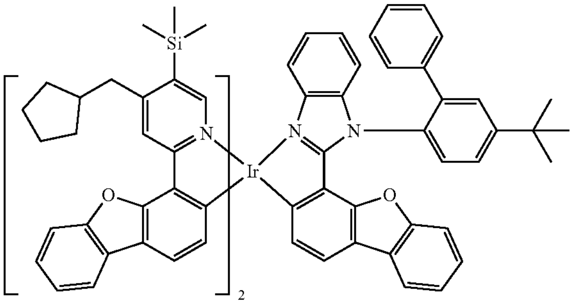

-continued
934
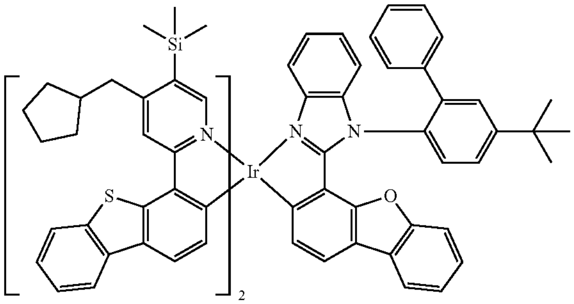
935
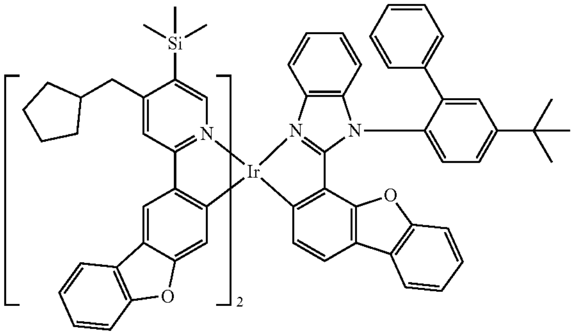
936
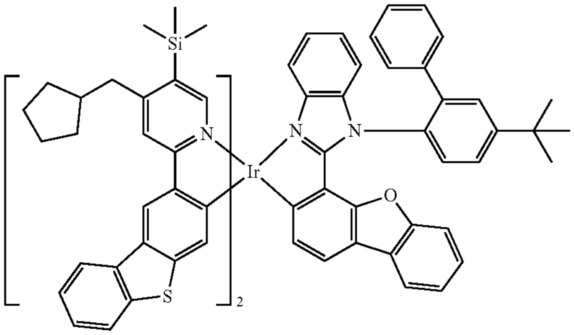
937
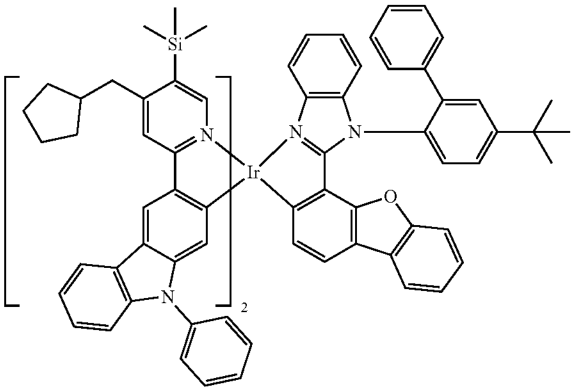
-continued
938
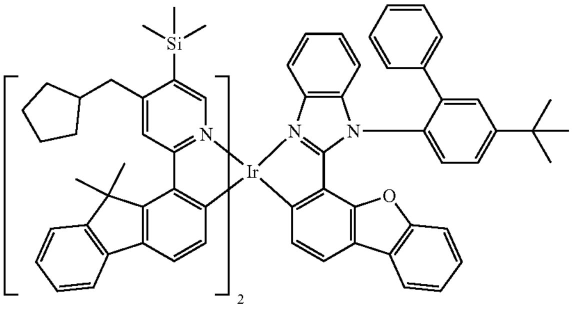
939
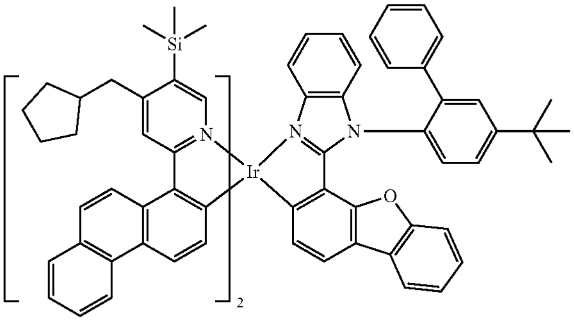
940
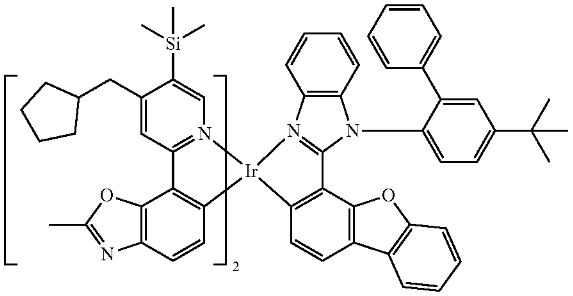
941
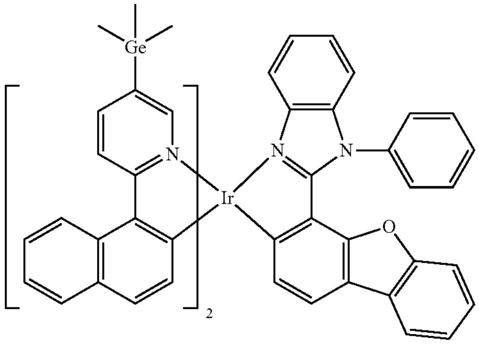

-continued
942
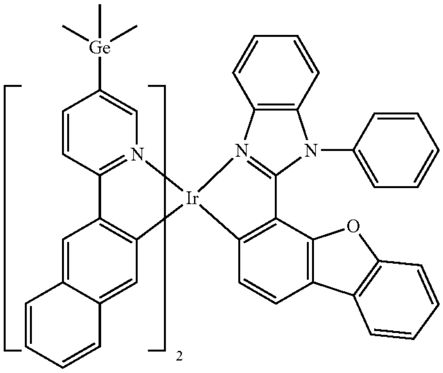
943
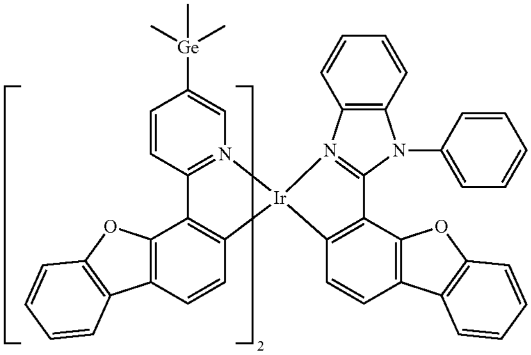
944
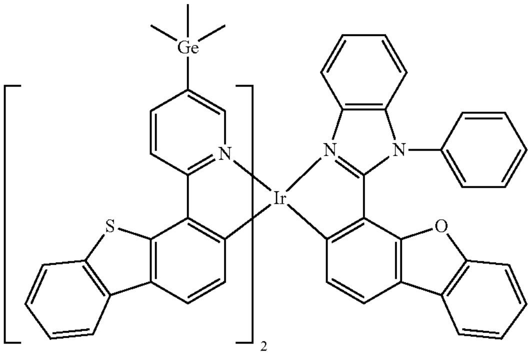
945
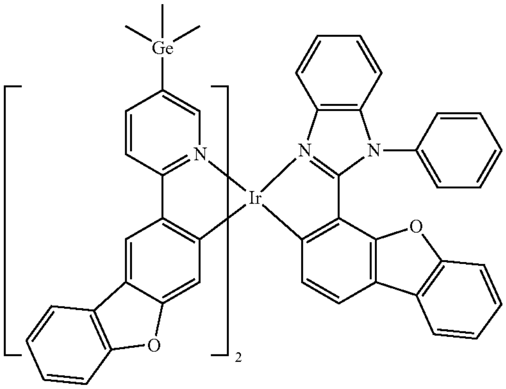
-continued
946
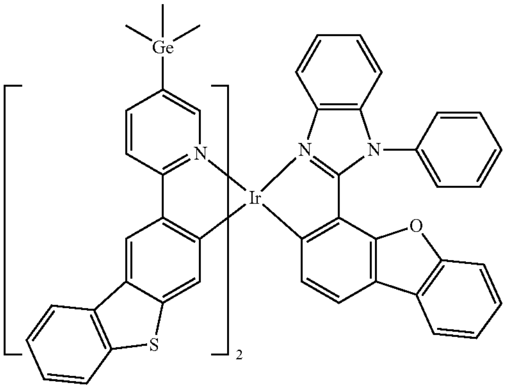
947
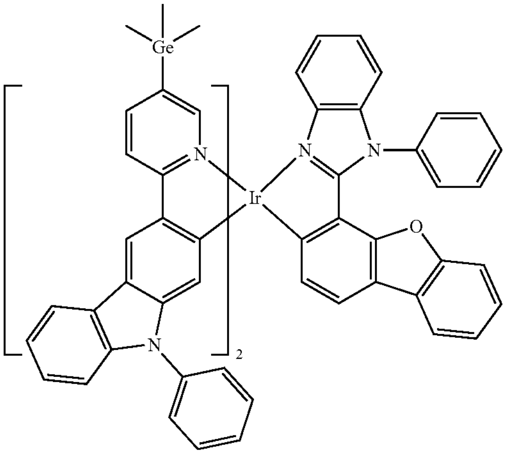
948
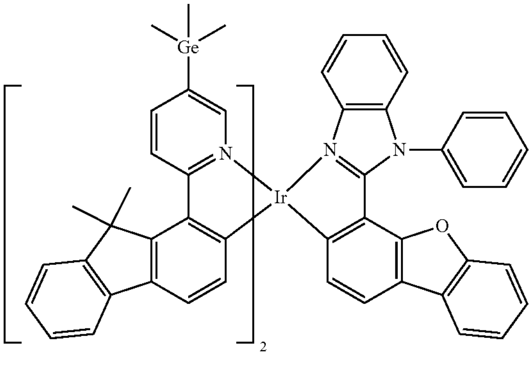
949
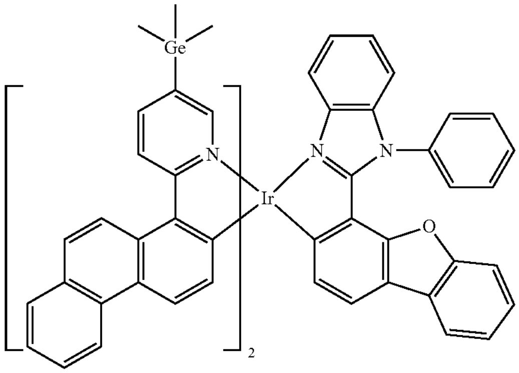

-continued
950
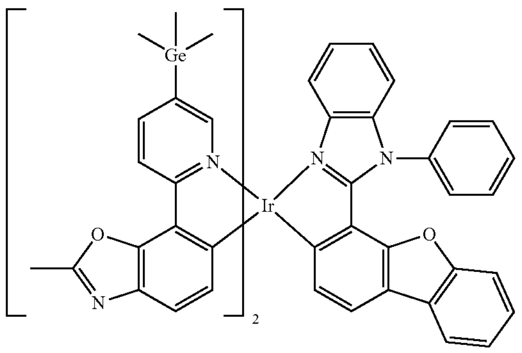
951
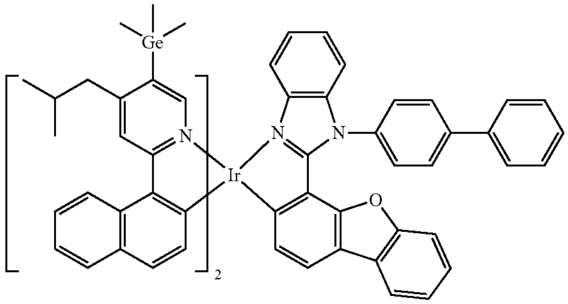
952
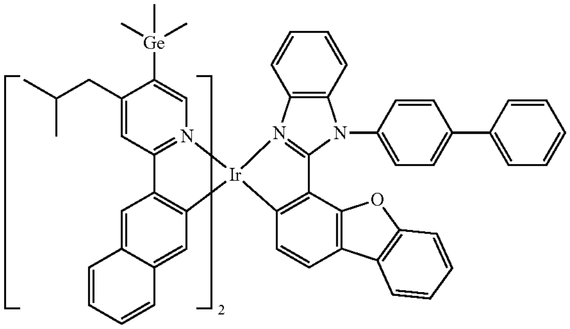
953
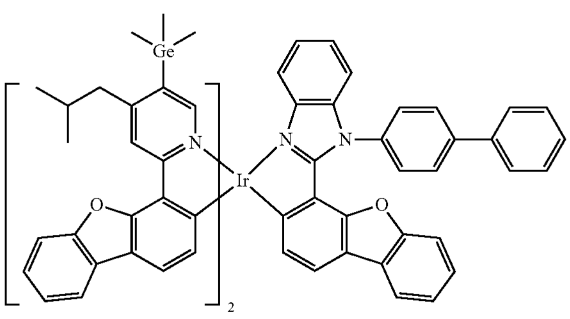
-continued
954
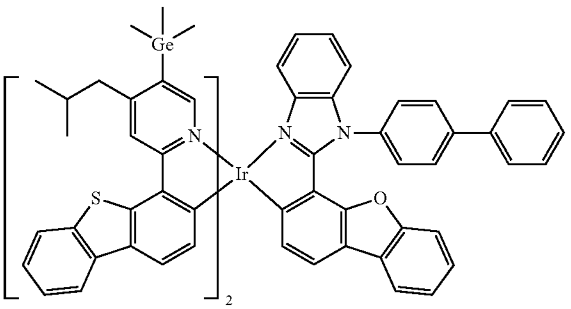
955
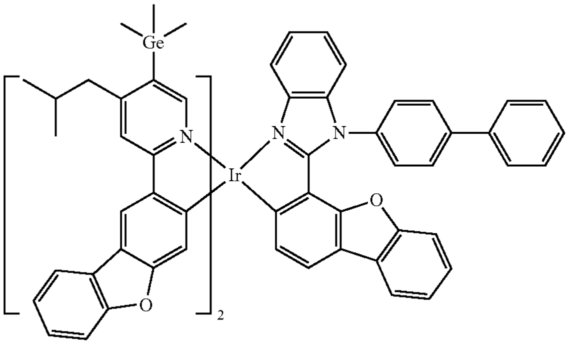
956
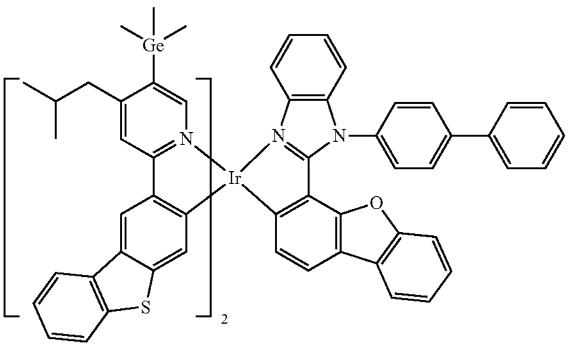
957
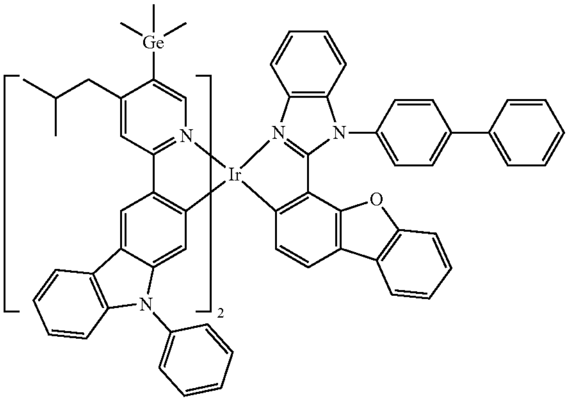

-continued
958
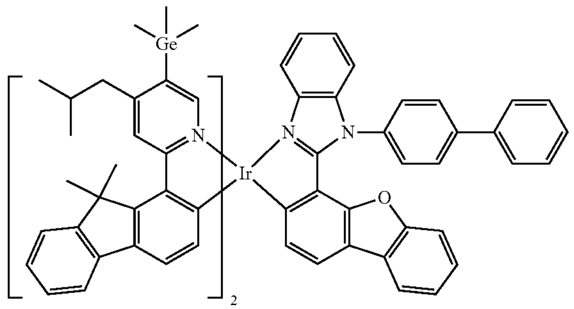
959
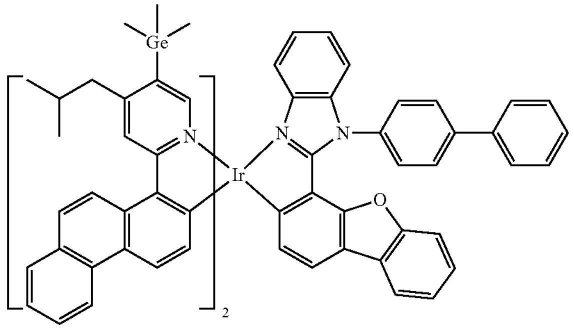
960
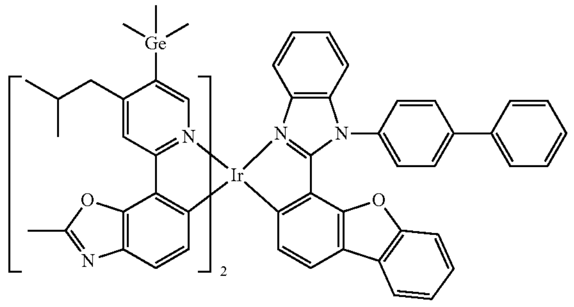
961
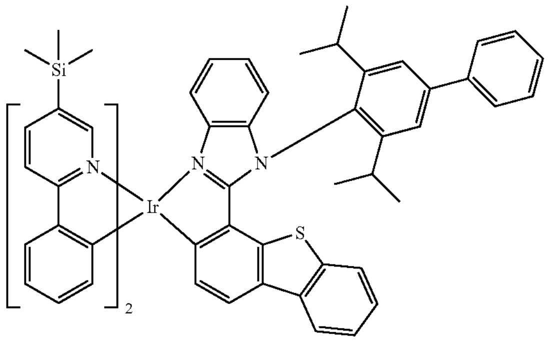
-continued
962
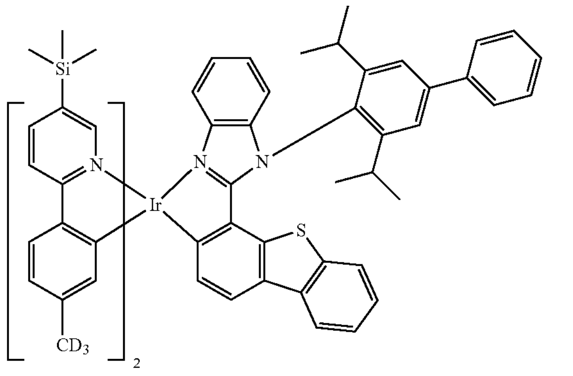
963
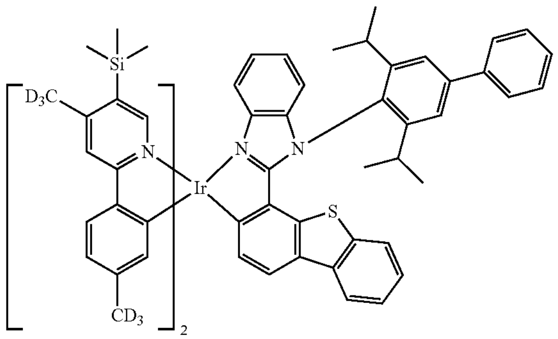
964
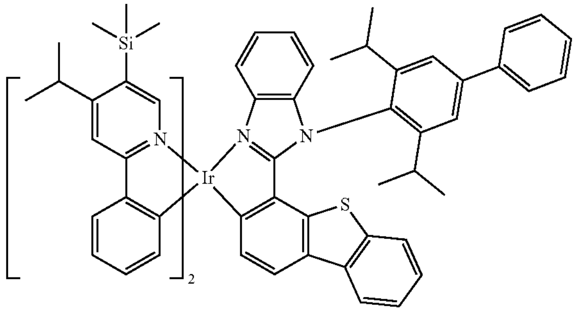
965
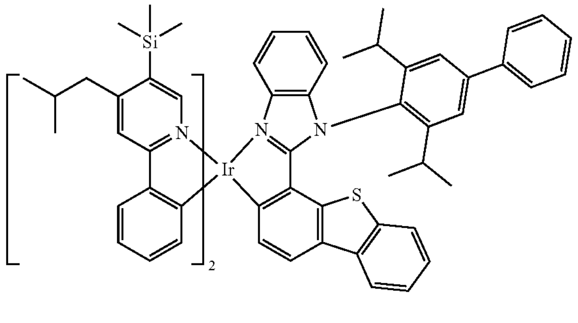

-continued
966
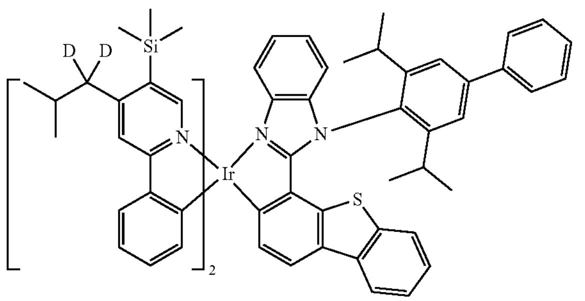
967
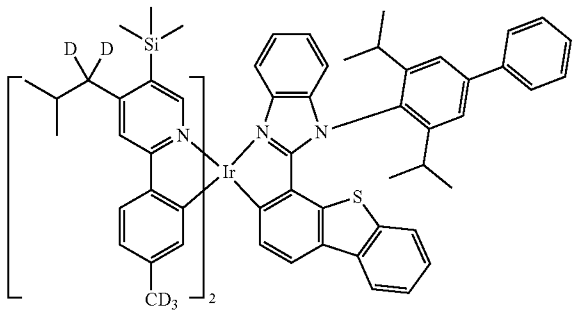
968
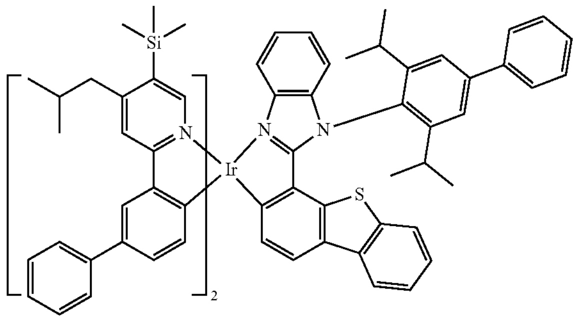
969
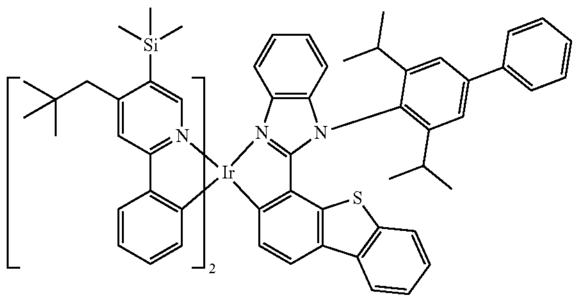
970
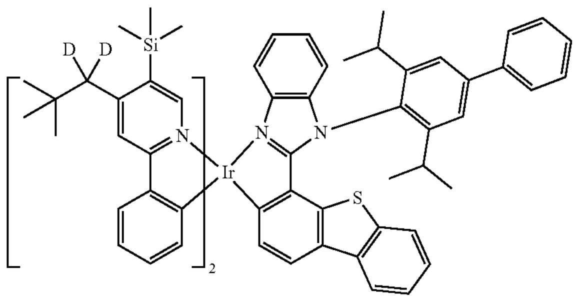
-continued
971
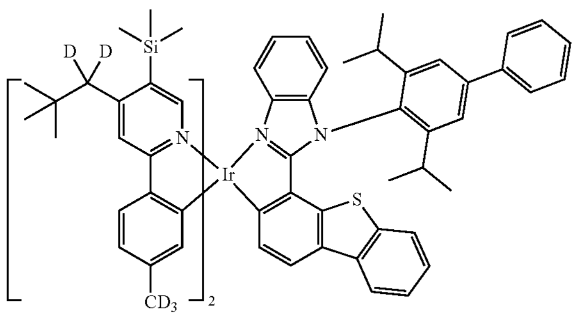
972
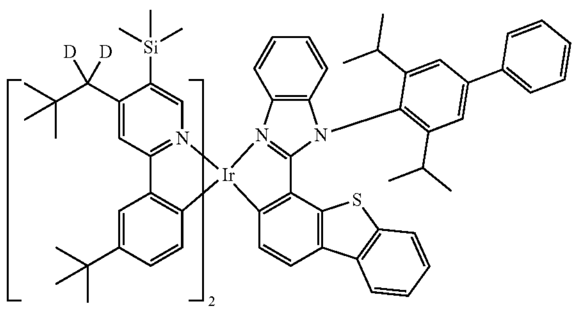
973
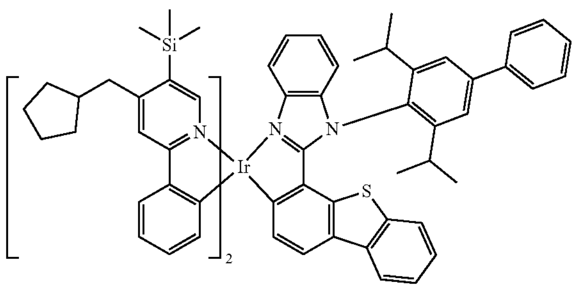
974
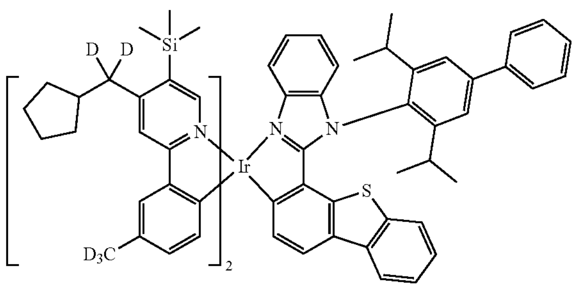
975
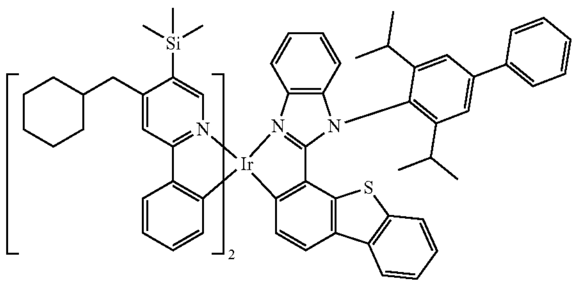

976
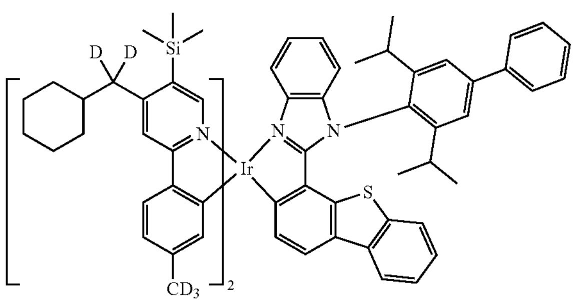
977
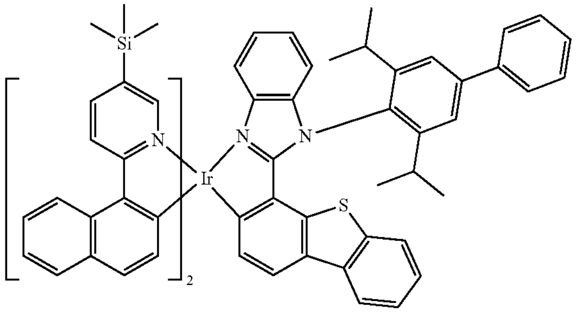
978
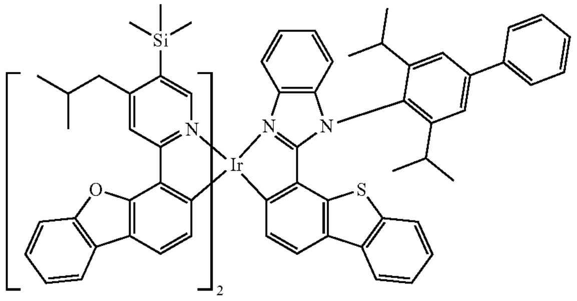
979
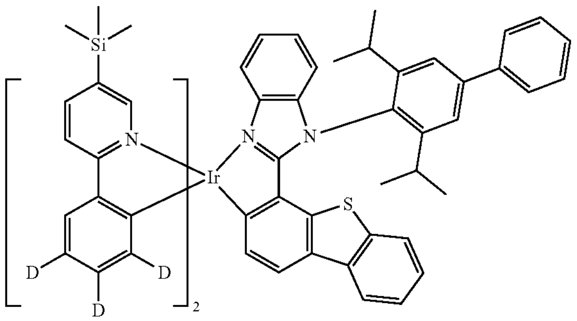
980
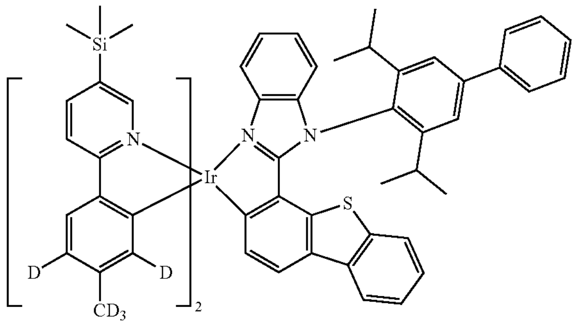
981
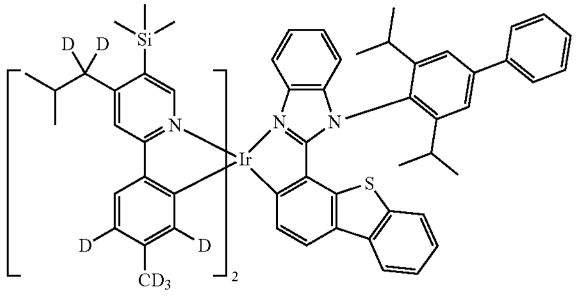
982
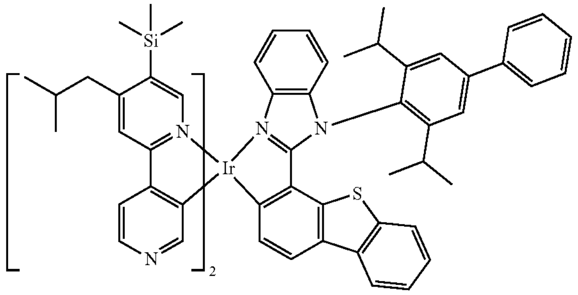
983
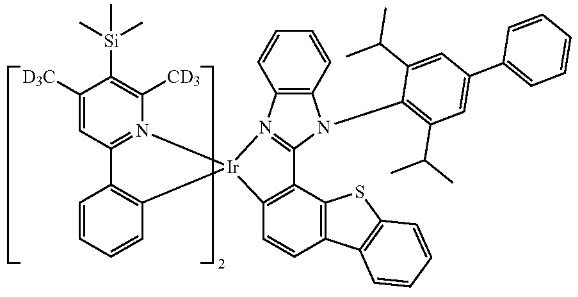
984
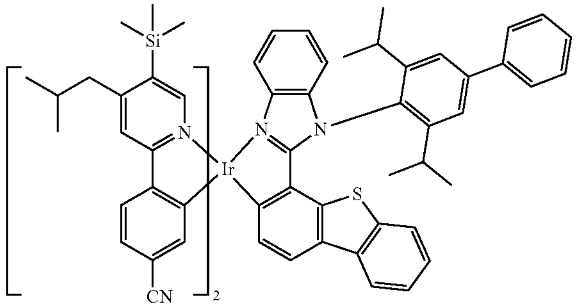

-continued
985
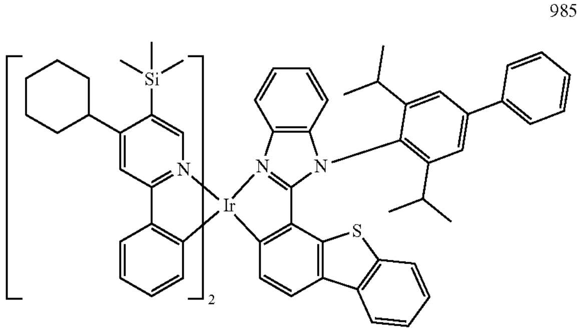
986
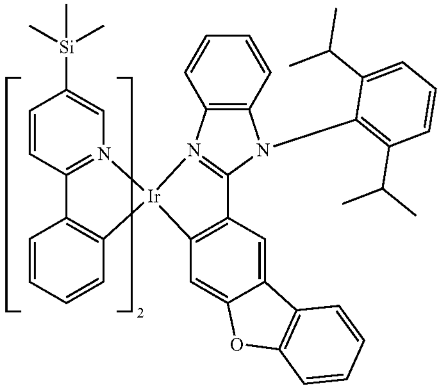
987
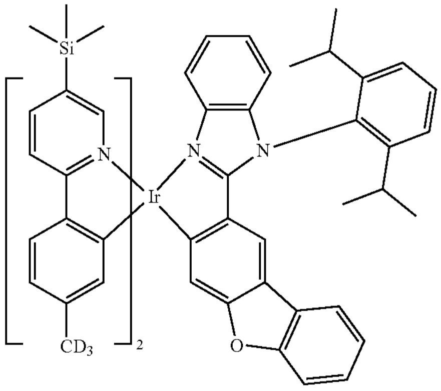
988
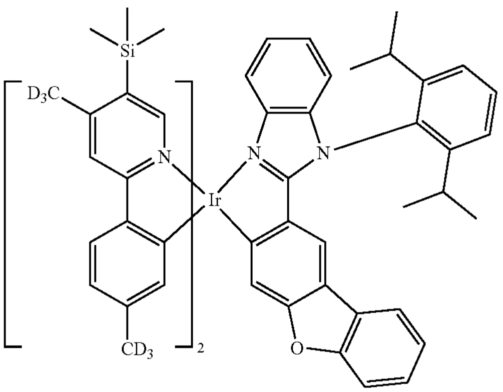
-continued
989
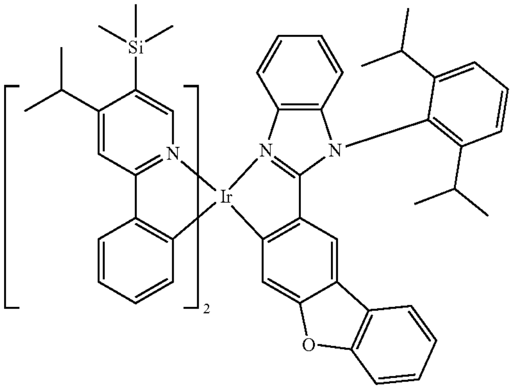
990
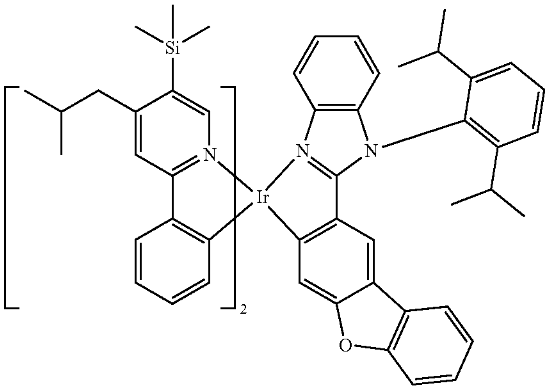
991
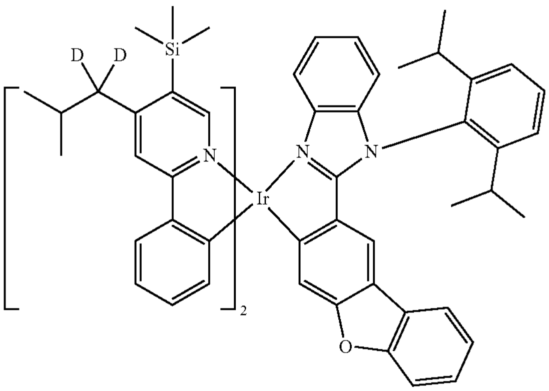
992
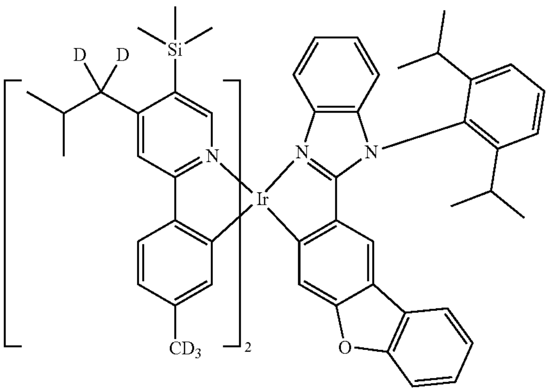

993
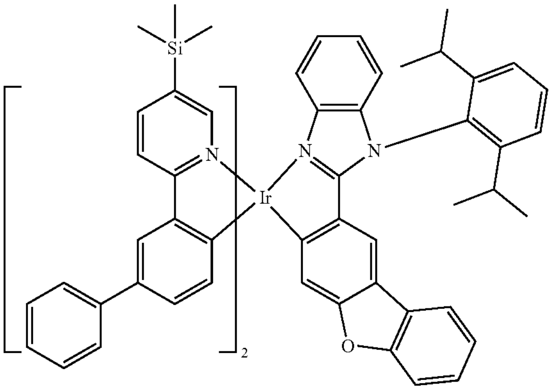
994
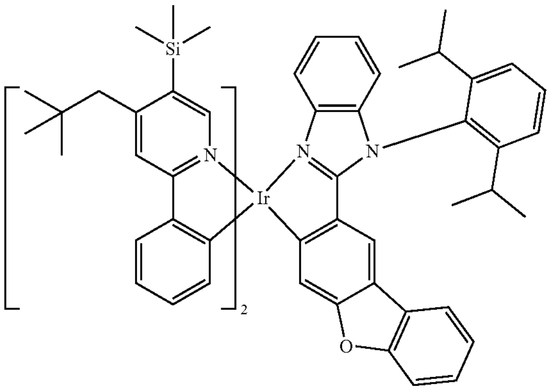
995
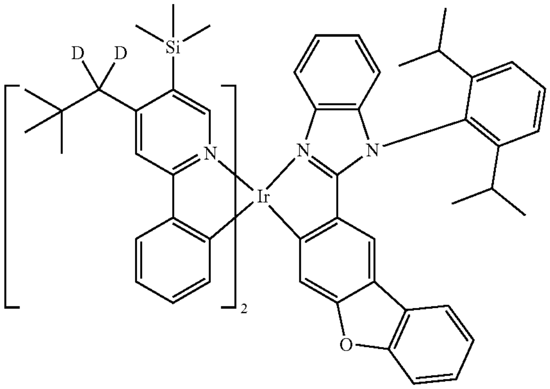
996
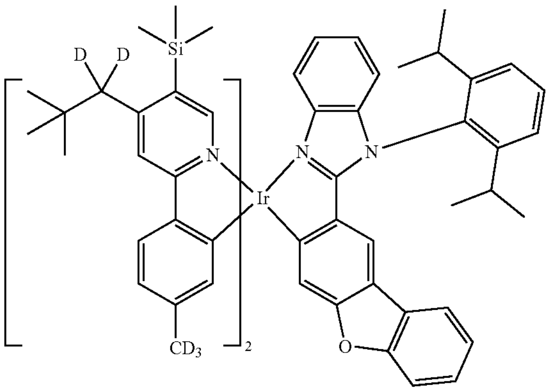
997
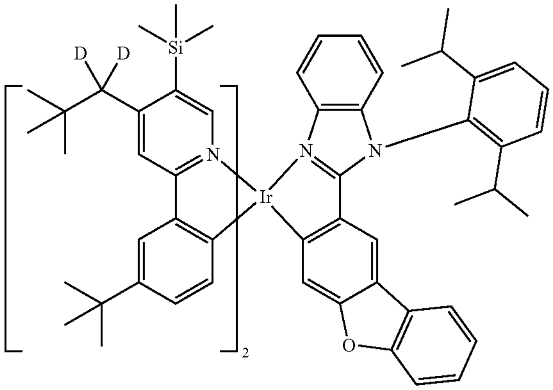
998
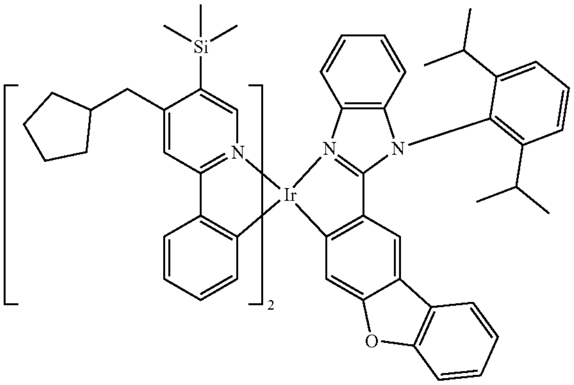
999
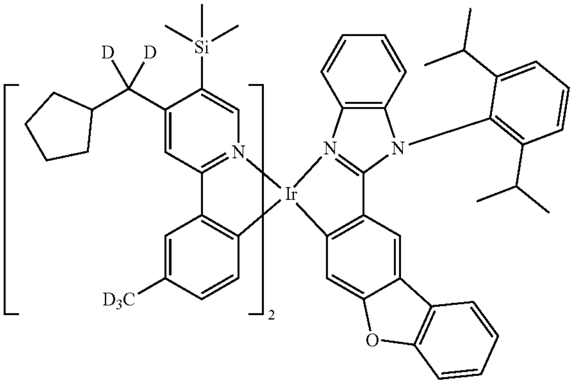
1000
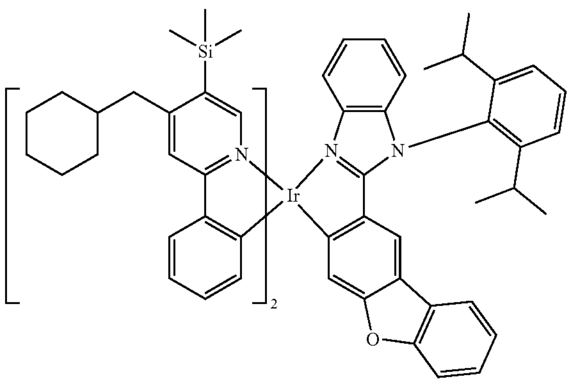

-continued
1001
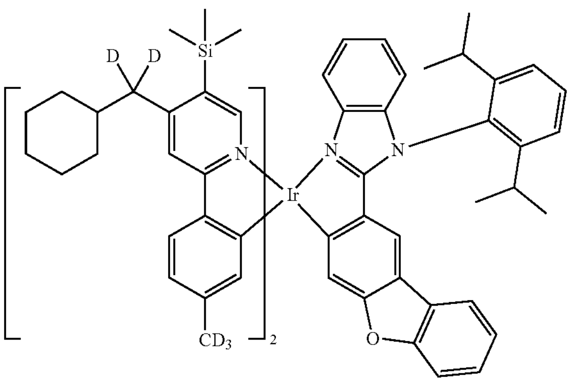
1002
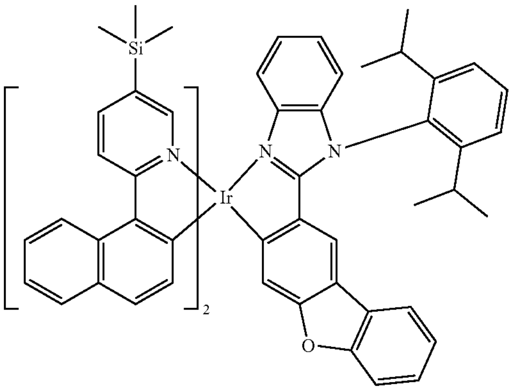
1003
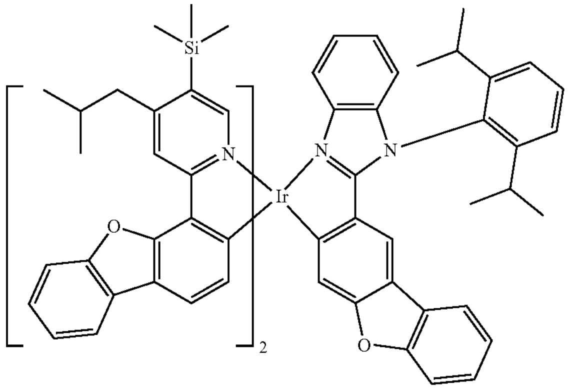
1004
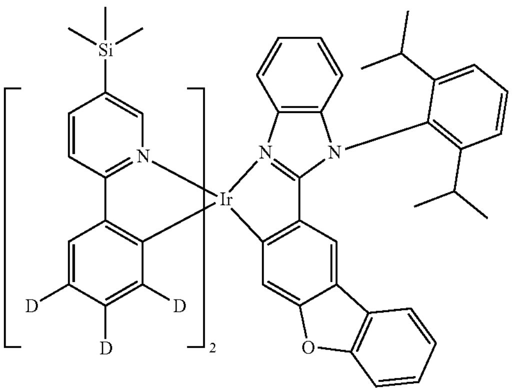
-continued
1005
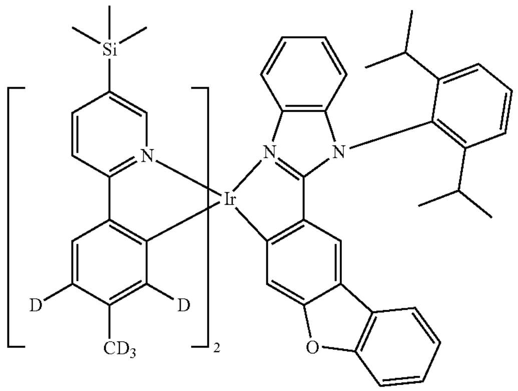
1006
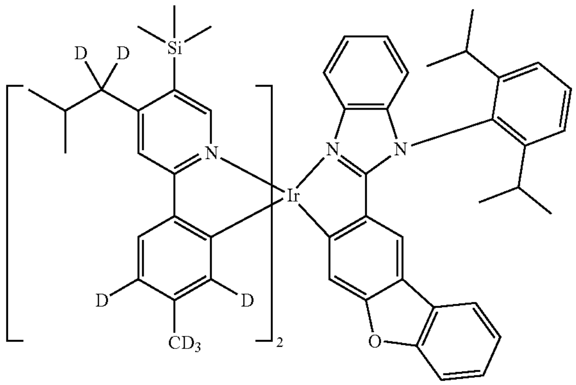
1007
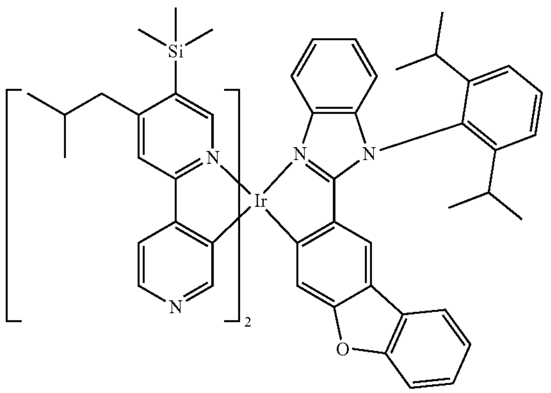

-continued
1008
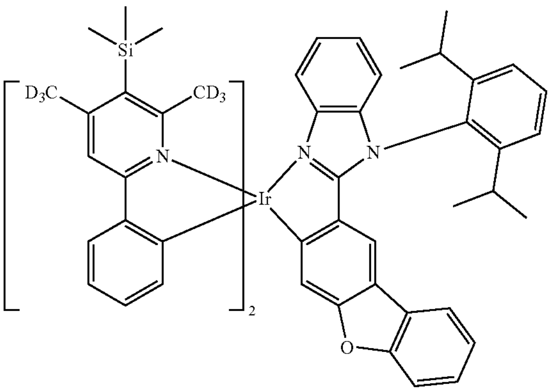
1009
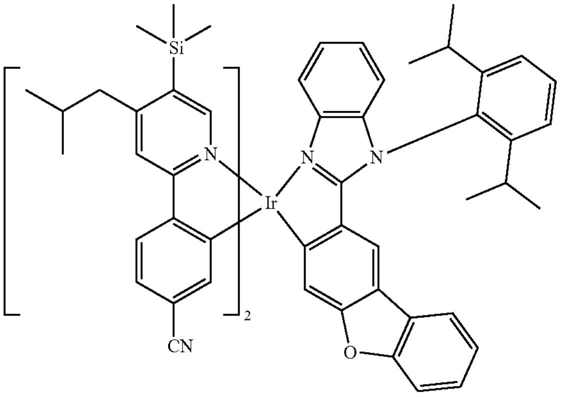
1010
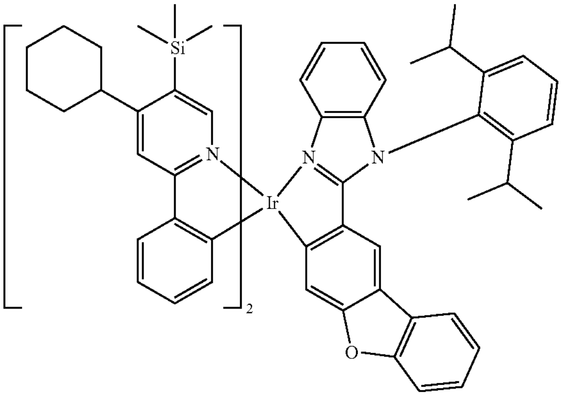
-continued
1011
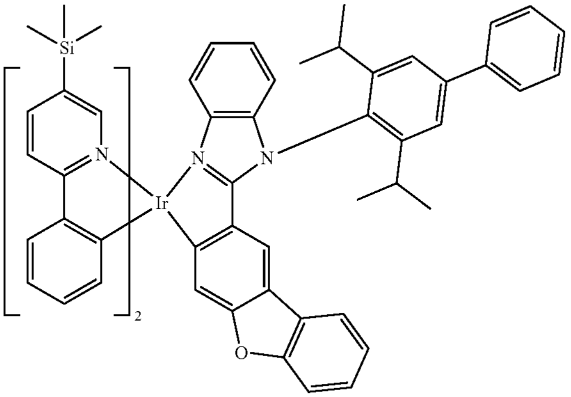
1012
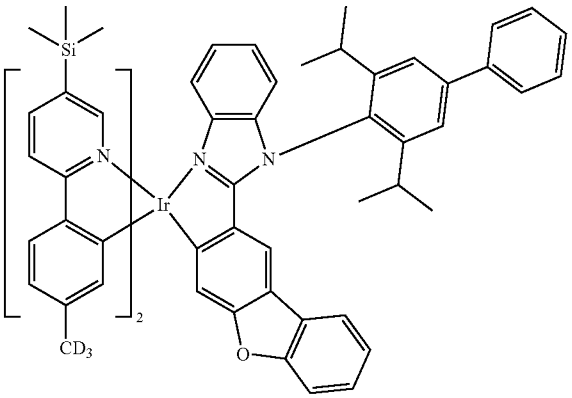
1013
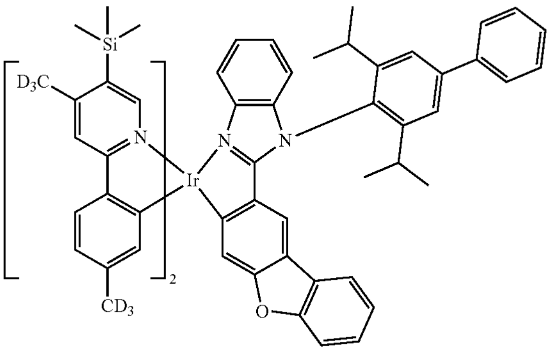
1014
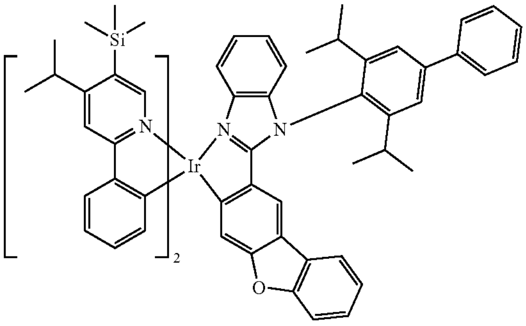

-continued
1015
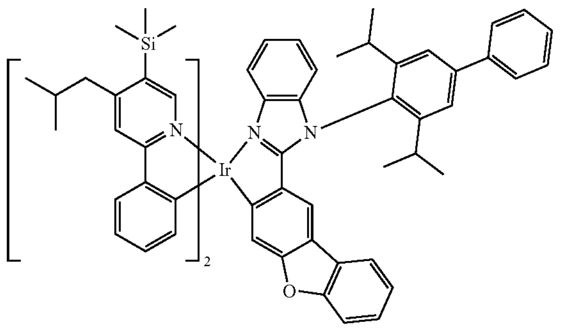
1016
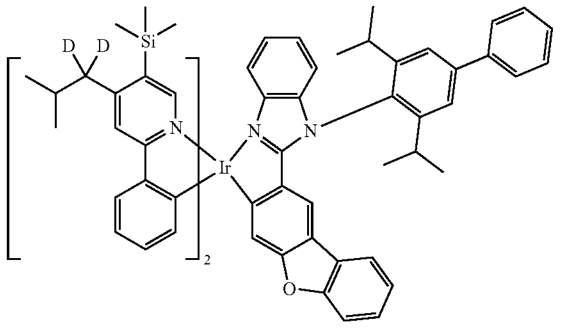
1017
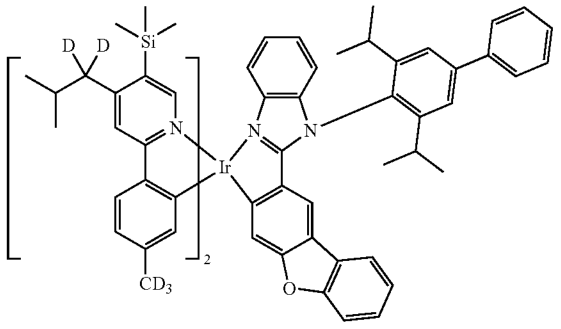
1018
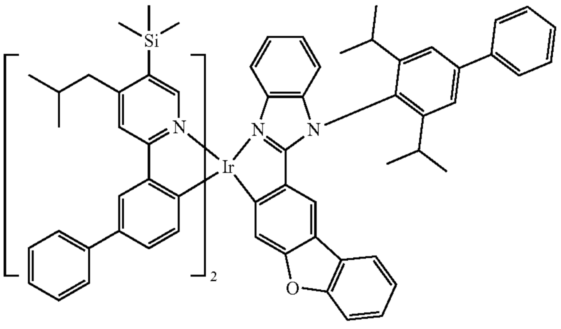
-continued
1019
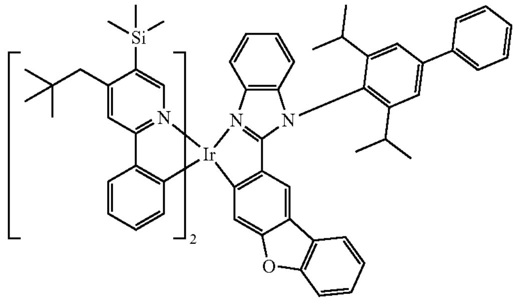
1020
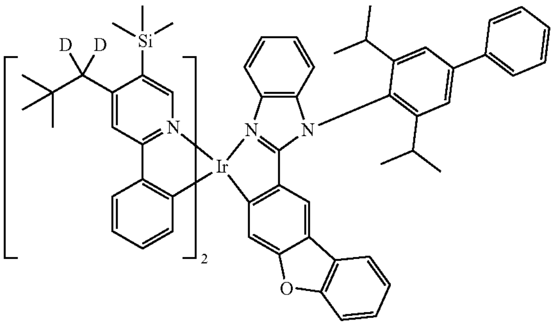
1021
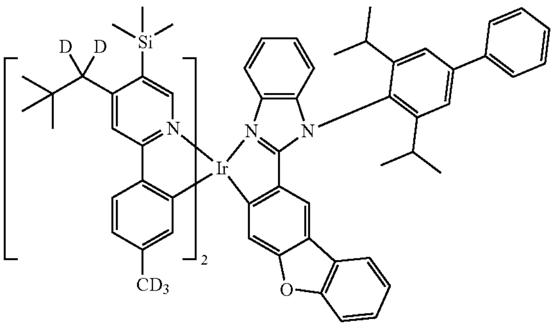
1022
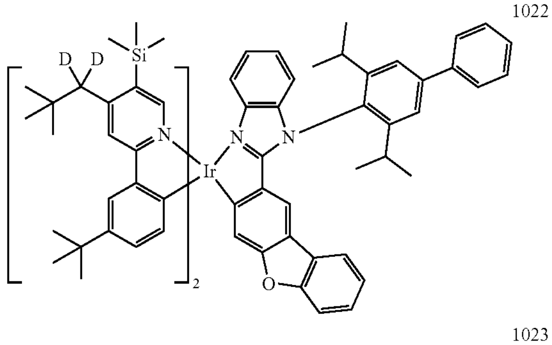
1023
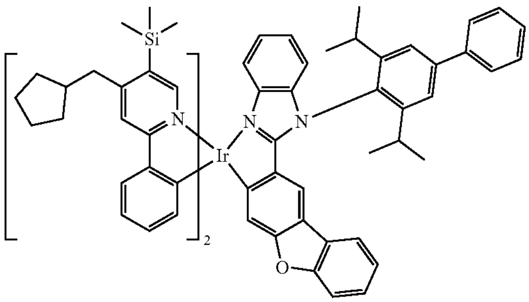

-continued
1024
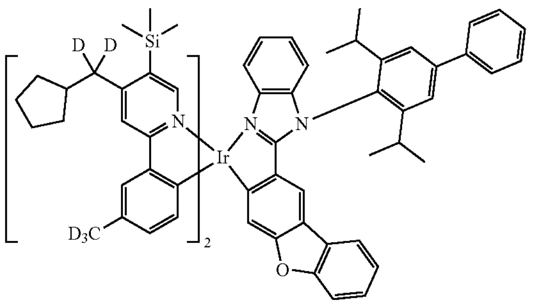
1025
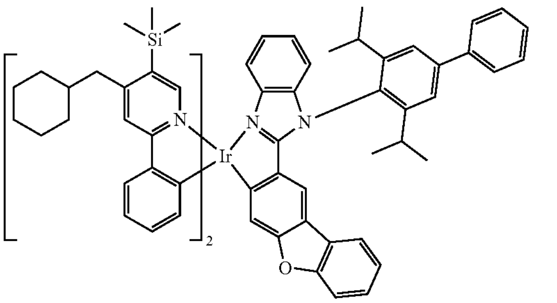
1026
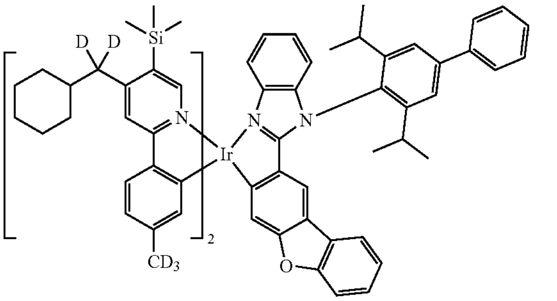
1027
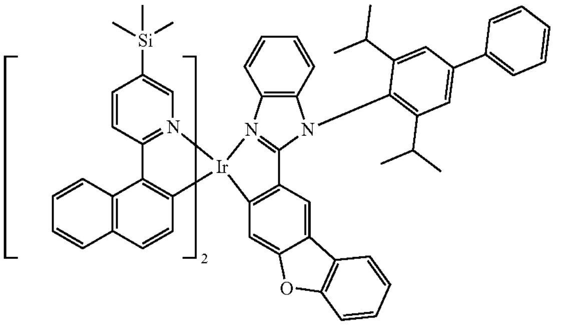
-continued
1028
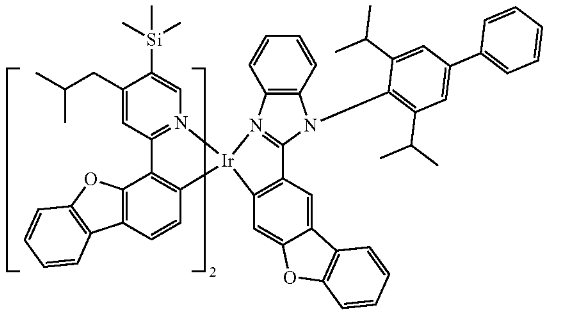
1029
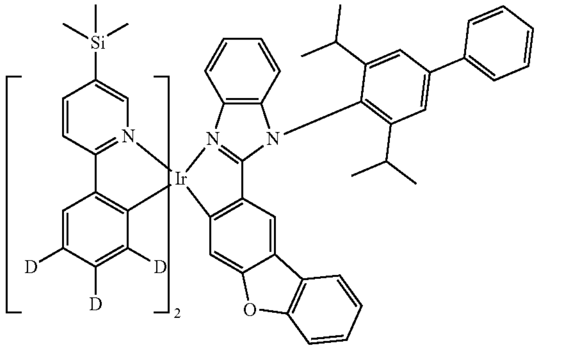
1030
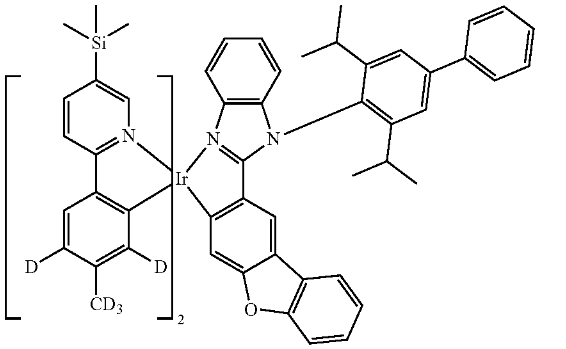
1031
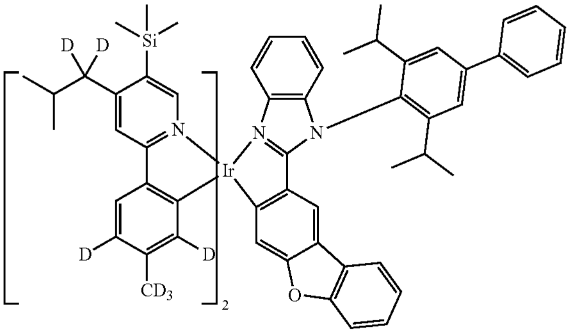

-continued
1032
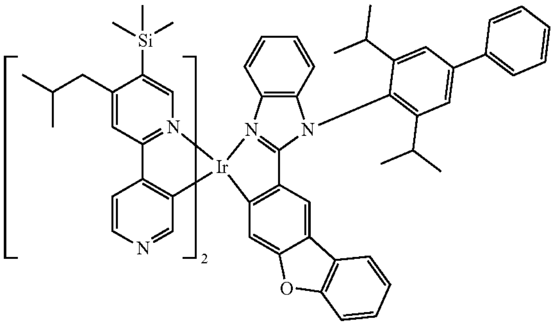
1033
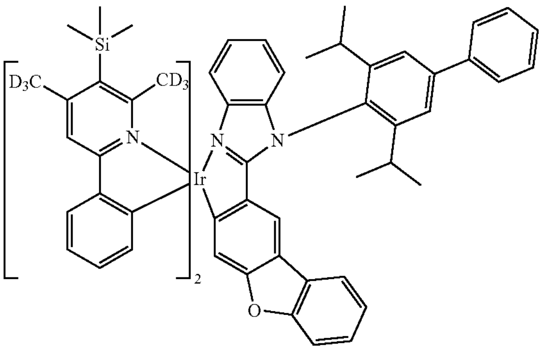
1034
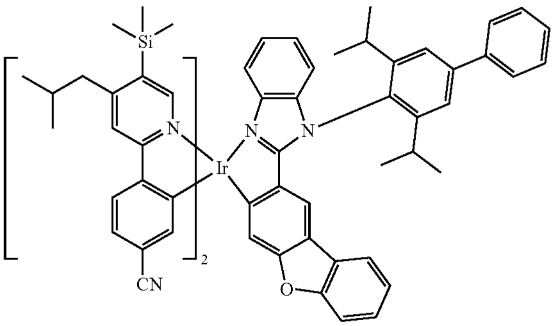
1035
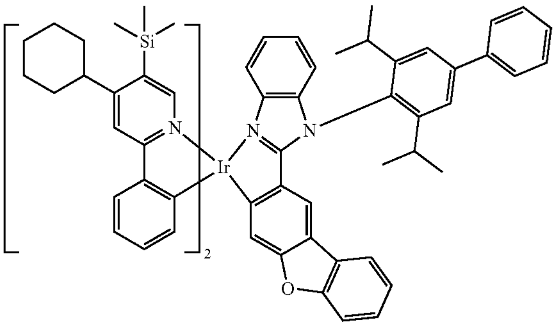
-continued
1036
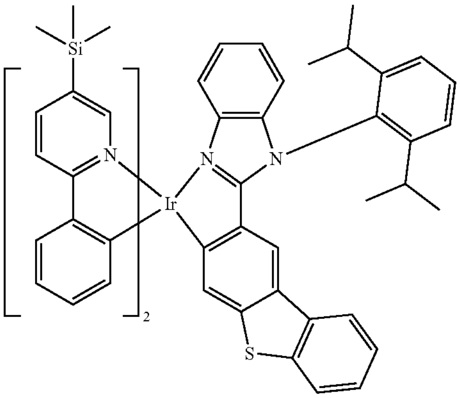
1037
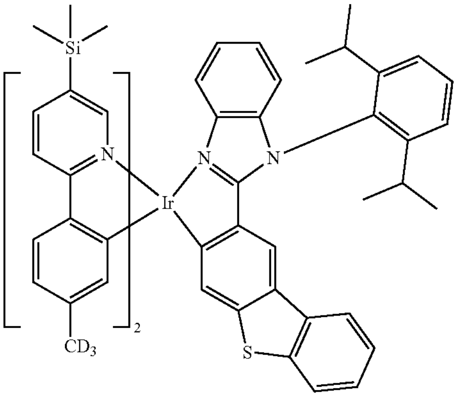
1038
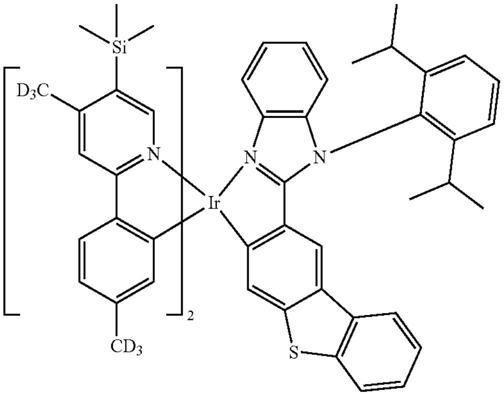
1039
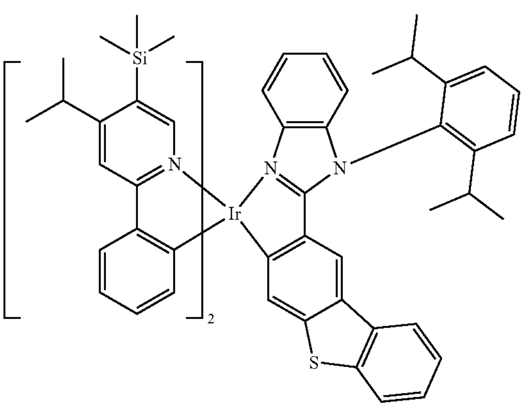

-continued
1040
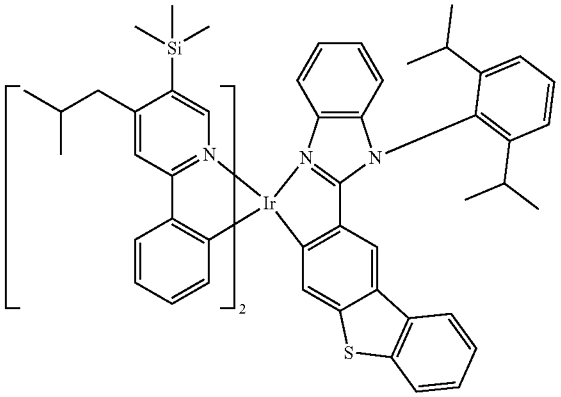
1041
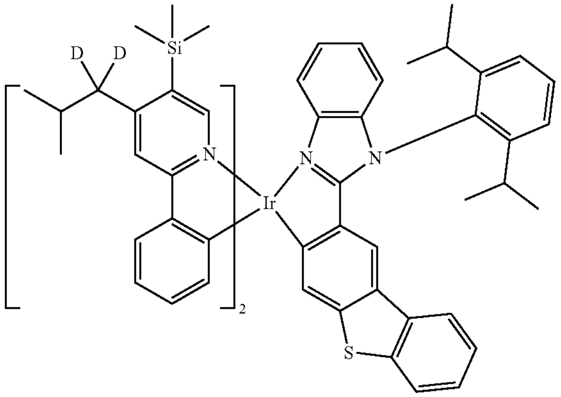
1042
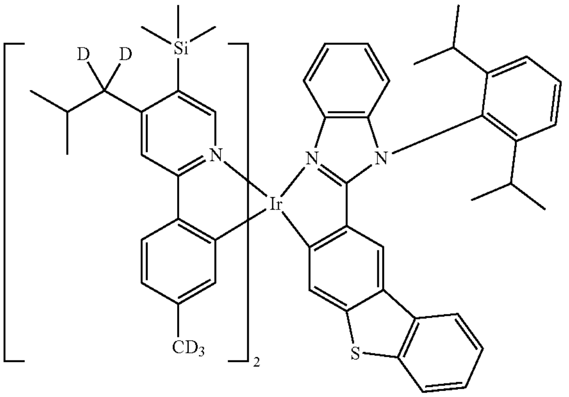
-continued
1043
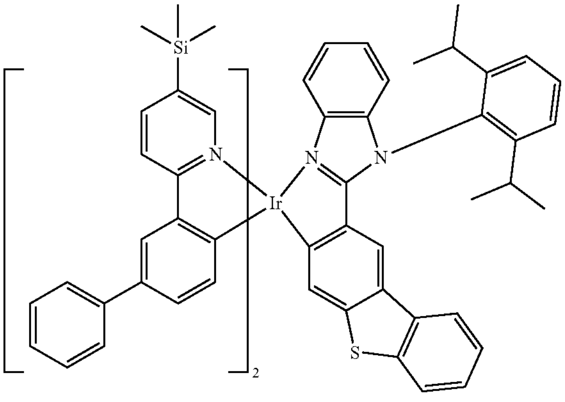
1044
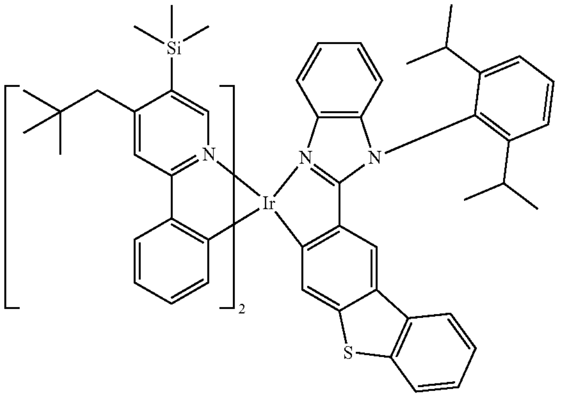
1045
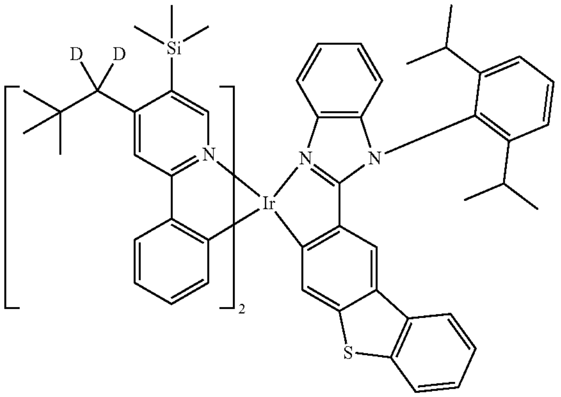

-continued
1046
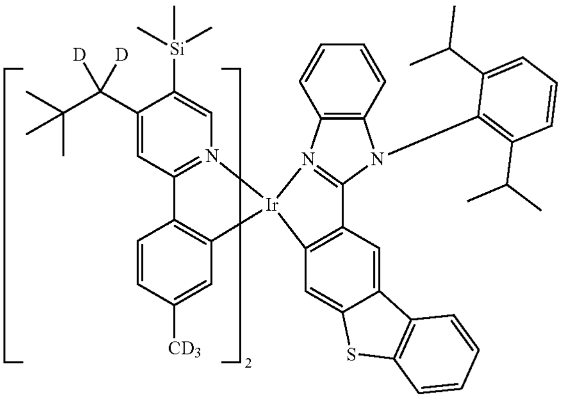
1047
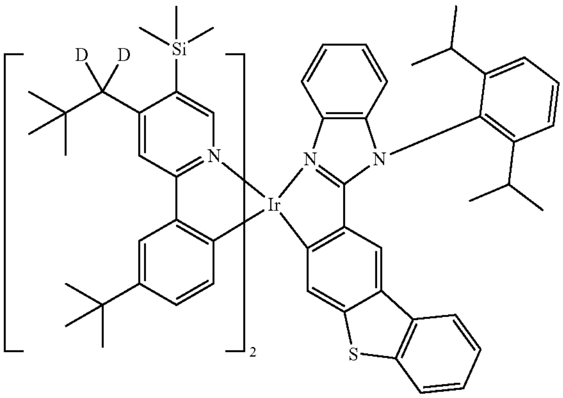
1048
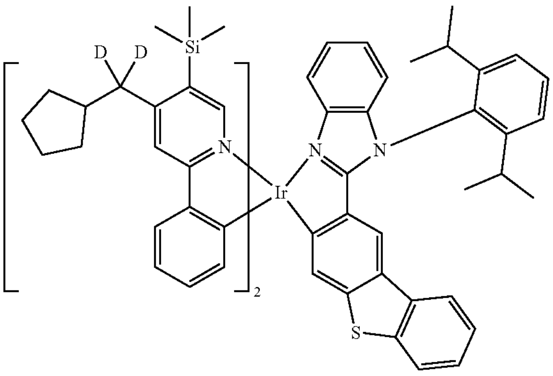
1049
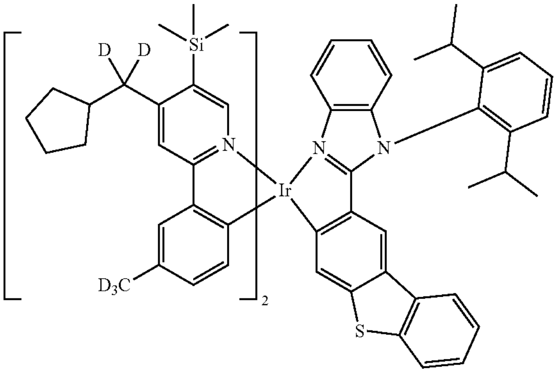
-continued
1050
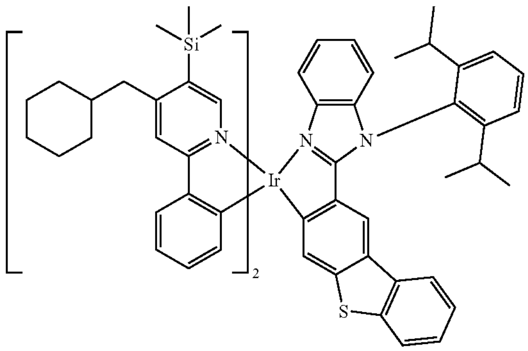
1051
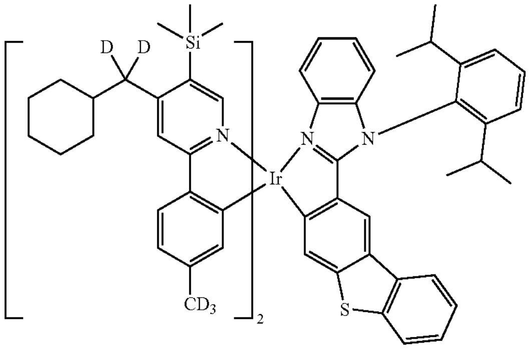
1052
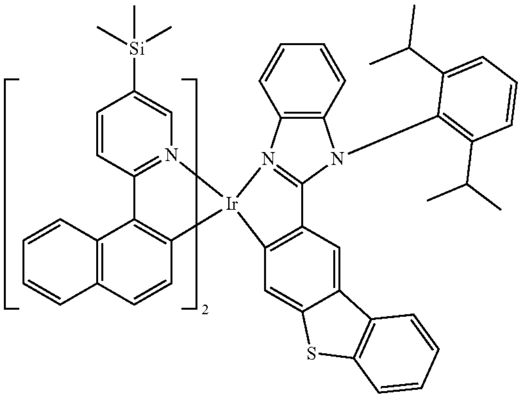
1053
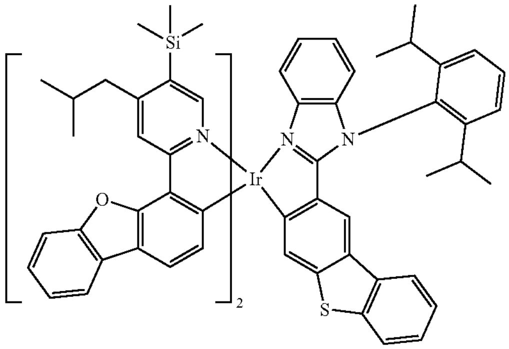

398
-continued
1054
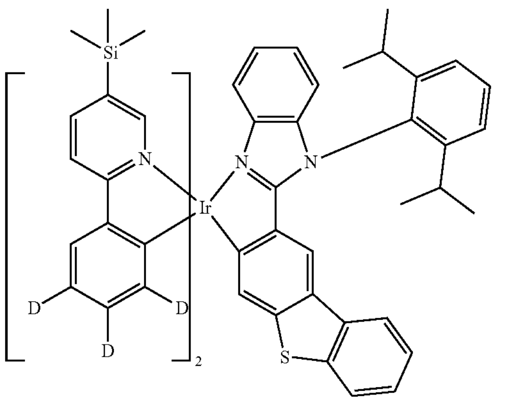
1055
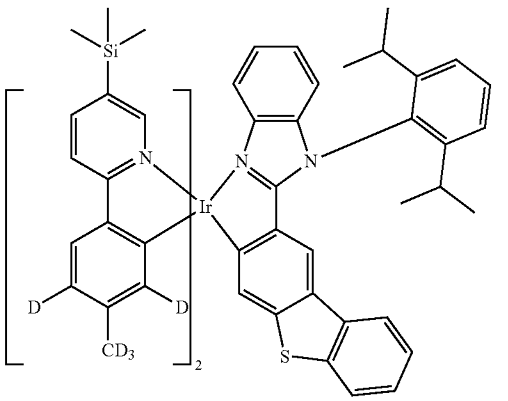
1056
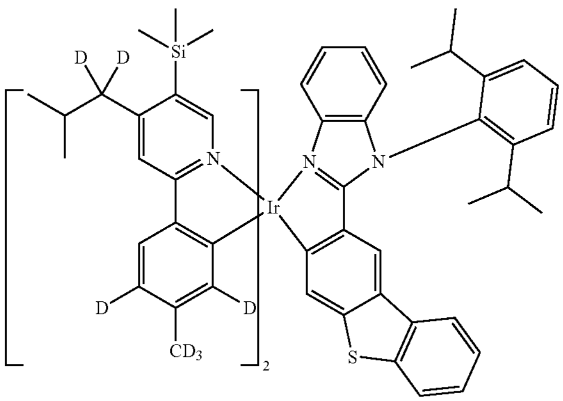
1057
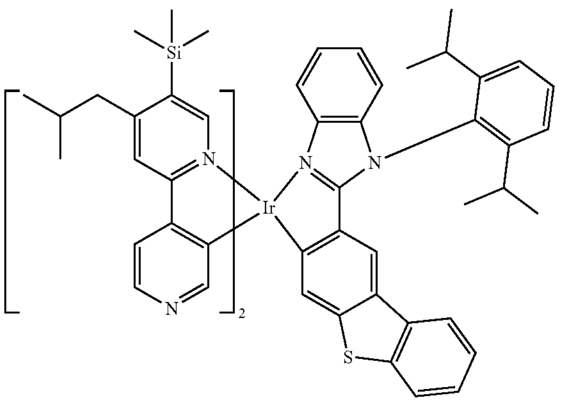
1058
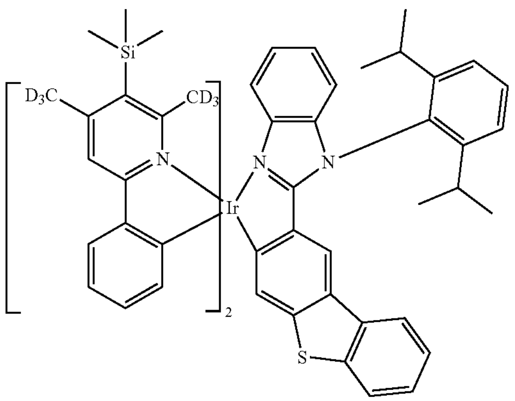
1059
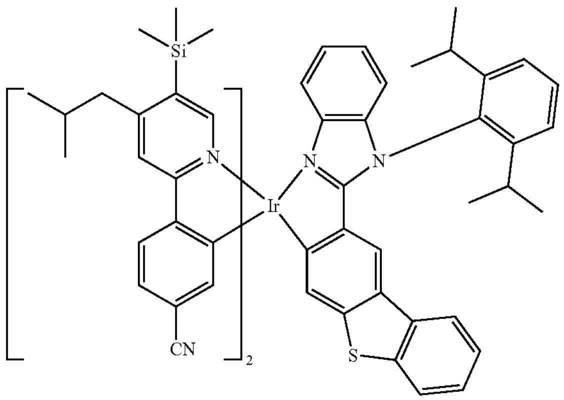

-continued
1060
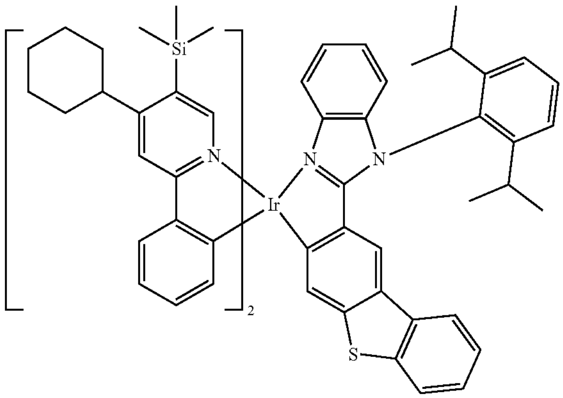
1061
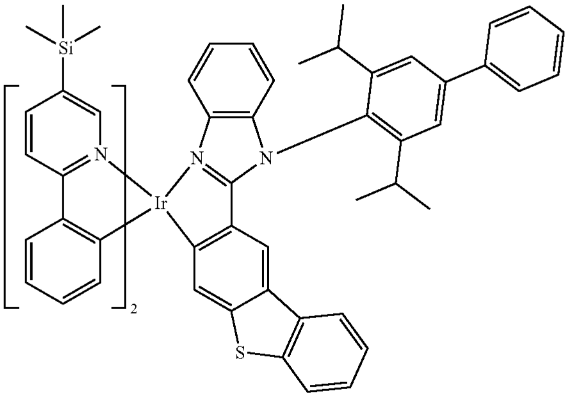
1062
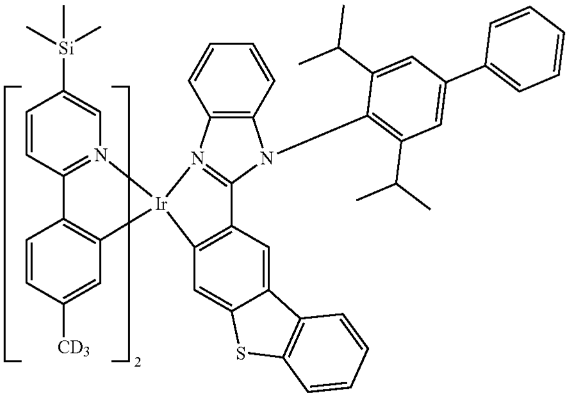
1063
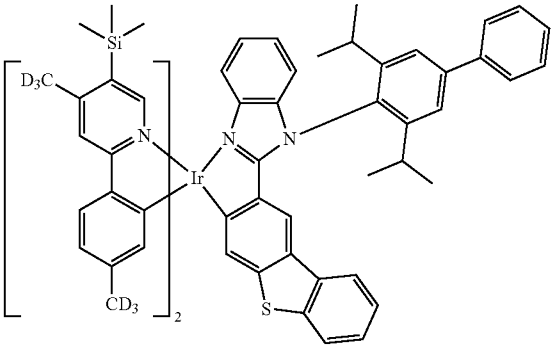
-continued
1064
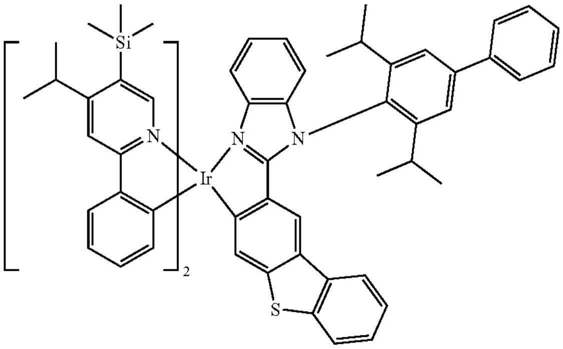
1065
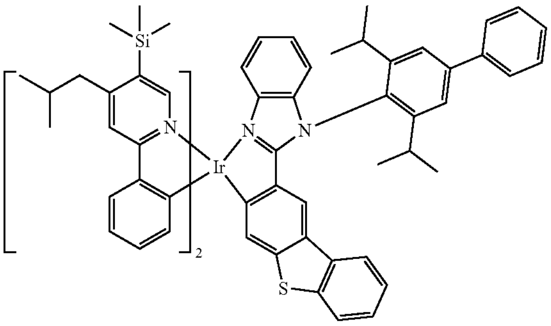
1066
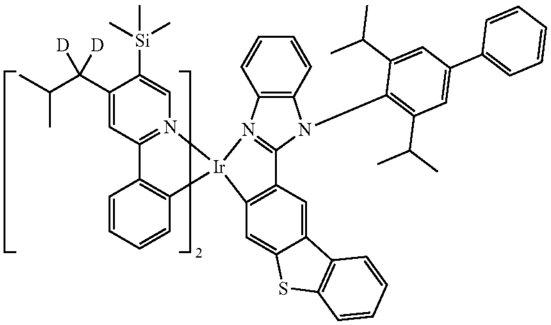
1067
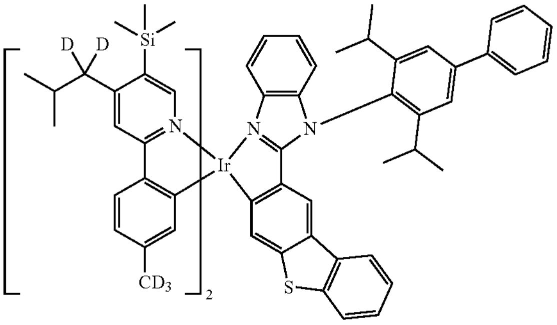

-continued
1068
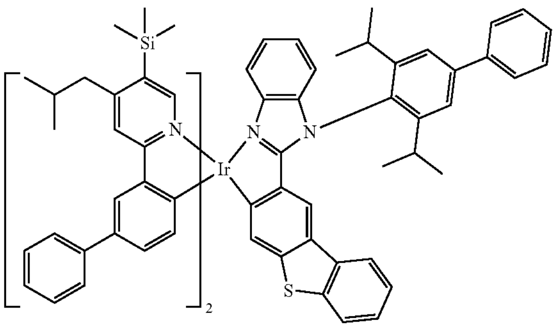
1069
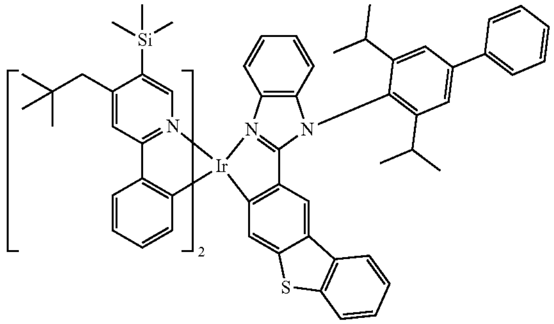
1070
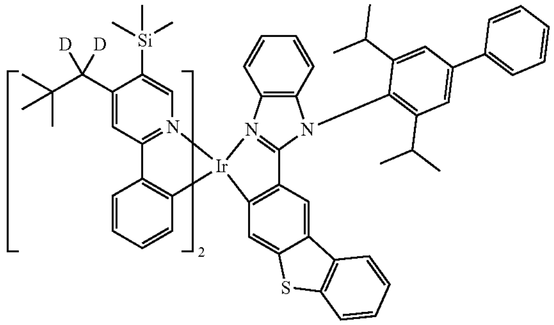
1071
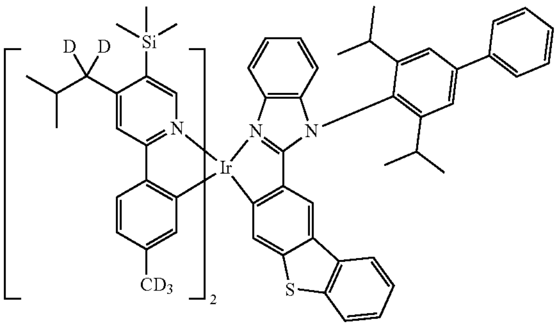
-continued
1072
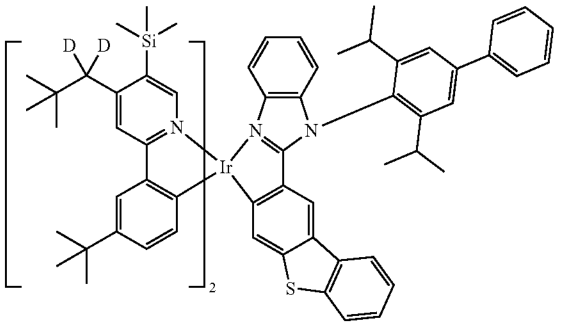
1073
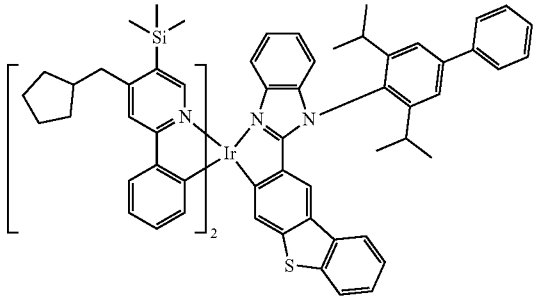
1074
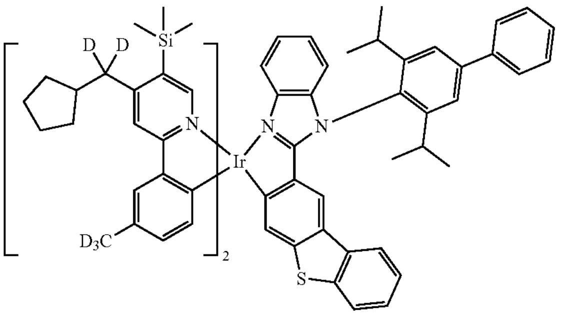
1075
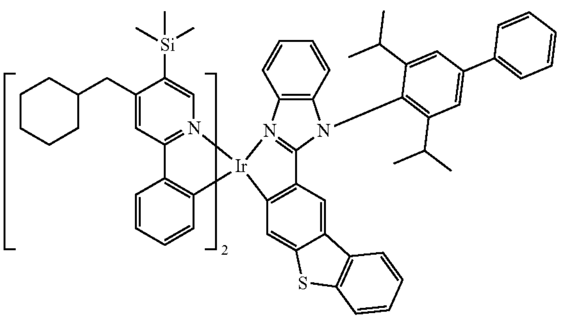

-continued
1076
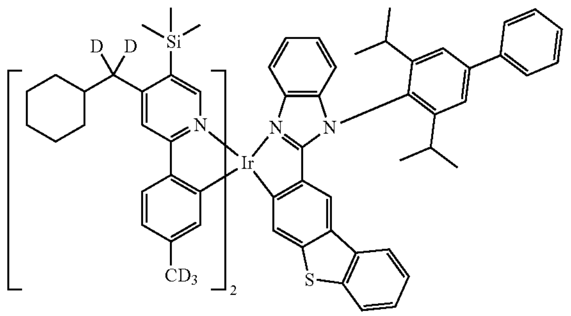
1077
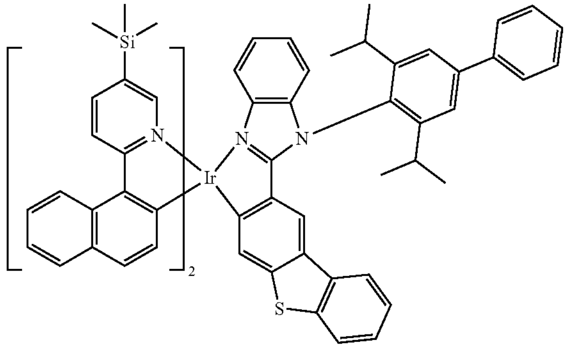
1078
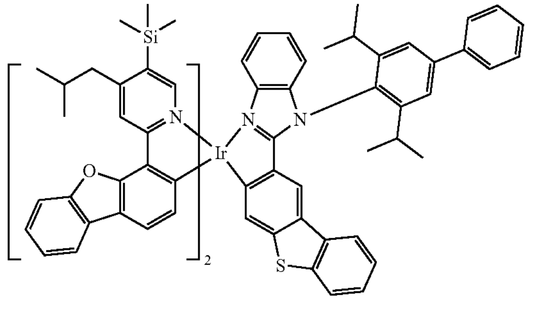
1079
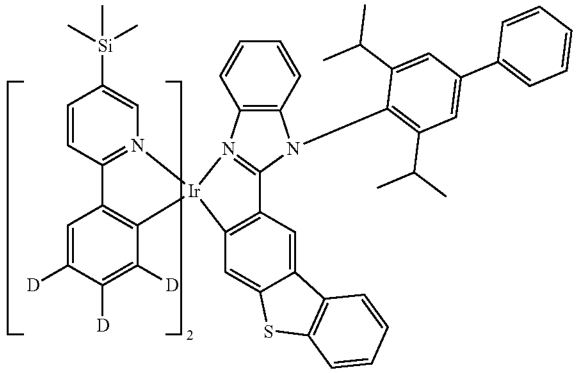
-continued
1080
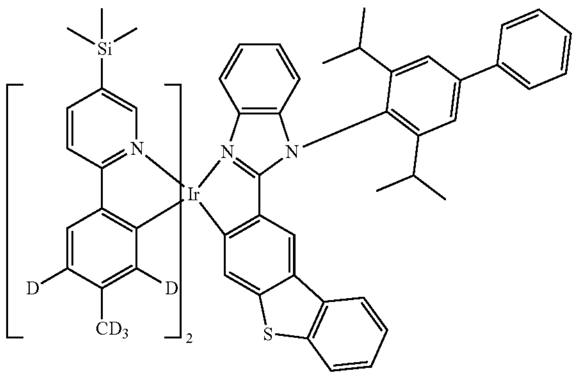
1081
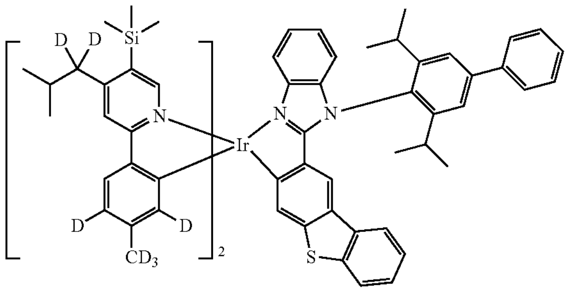
1082
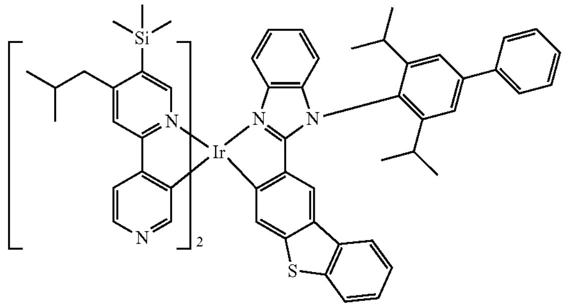
1083
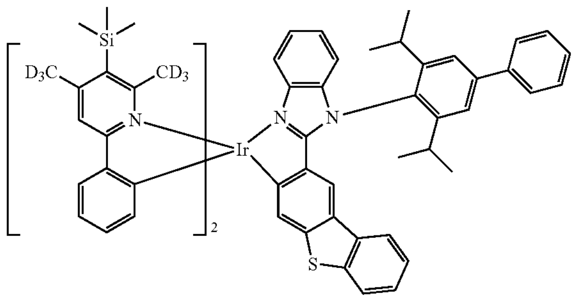

-continued
1084
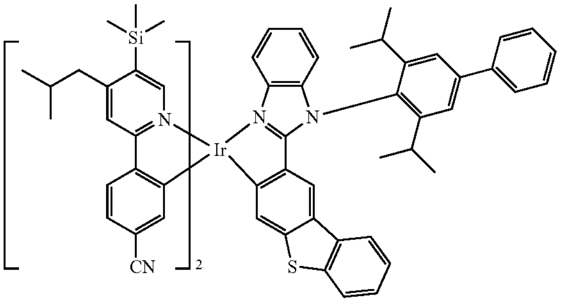
1085
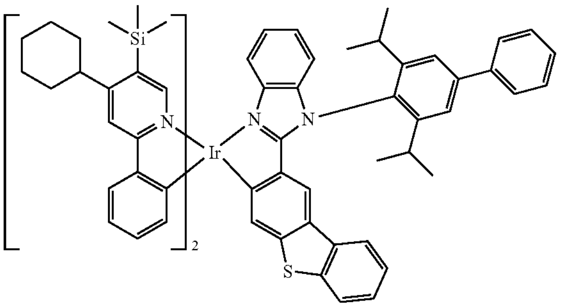
1086
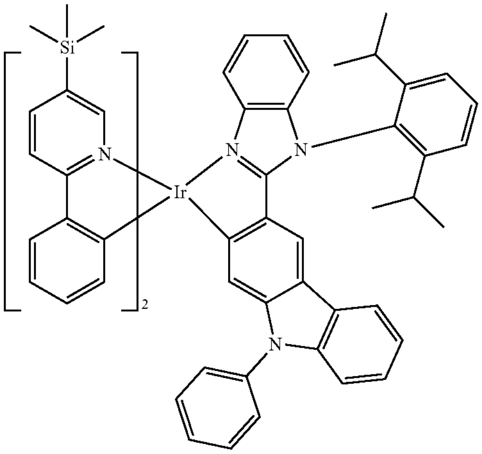
1087
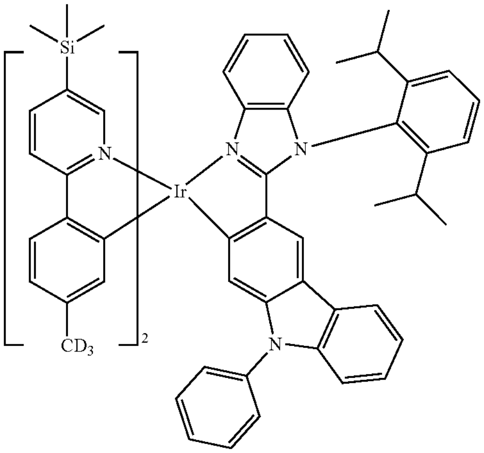
-continued
1088
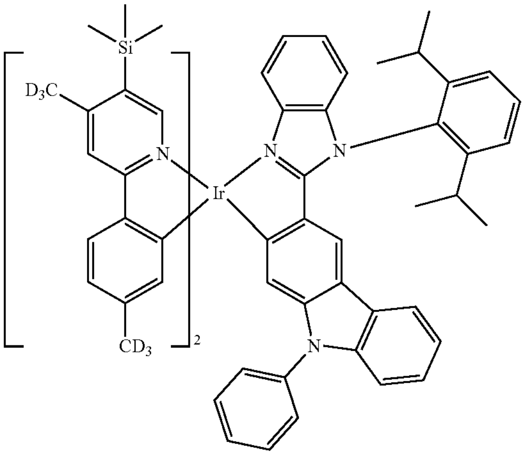
1089
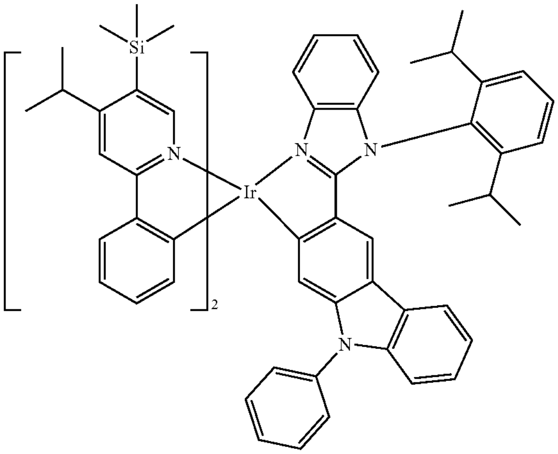
1090
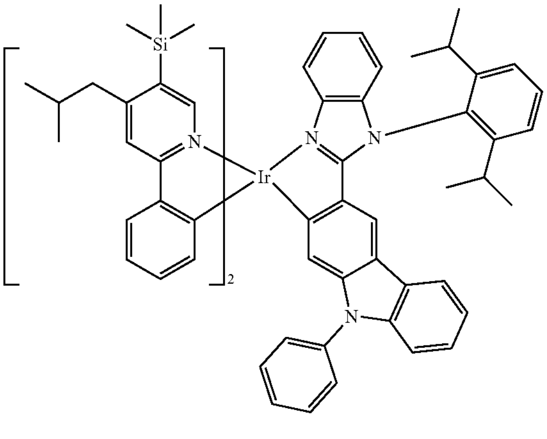

-continued
1091
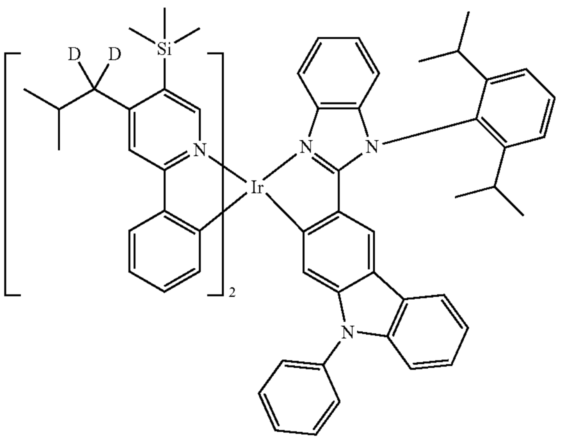
1092
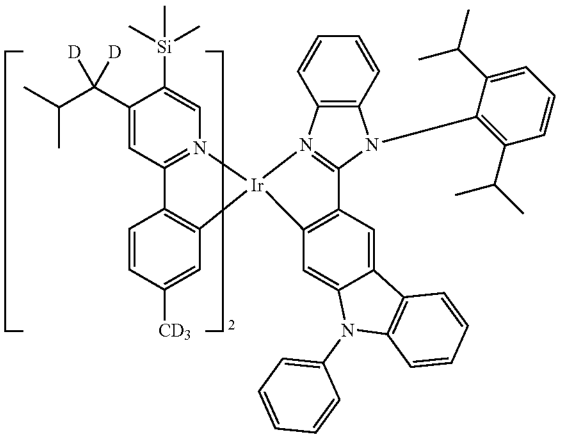
1093
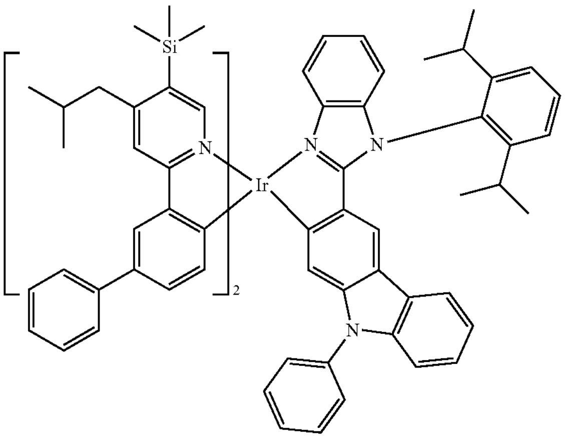
-continued
1094
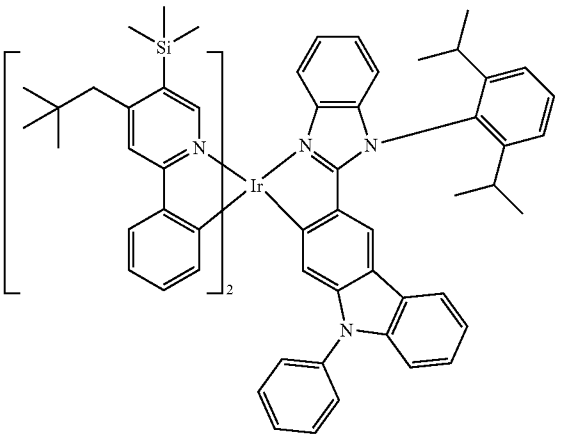
1095
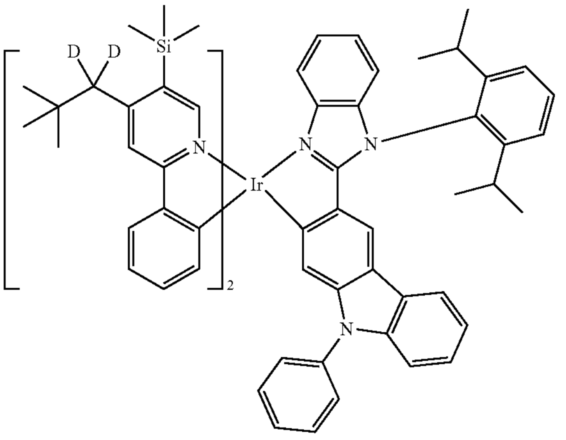
1096
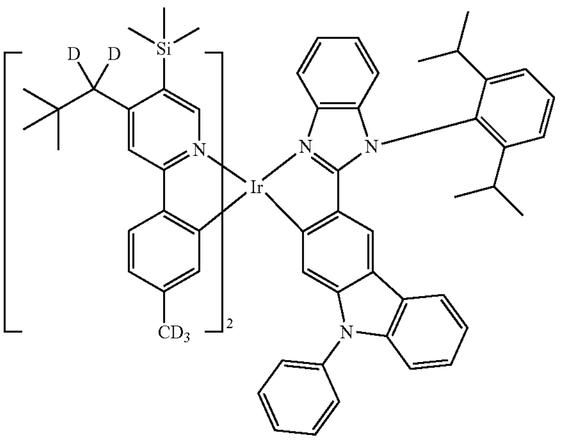

-continued
1097
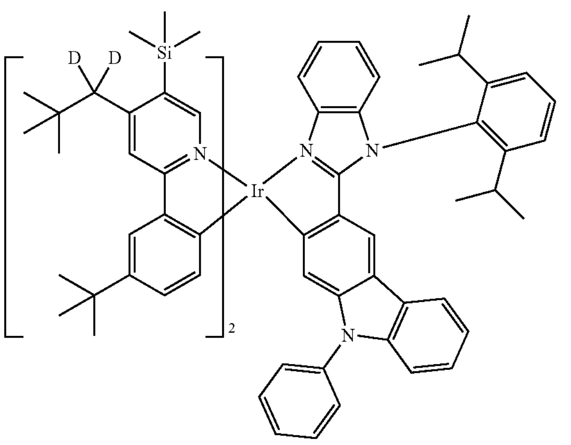
1098
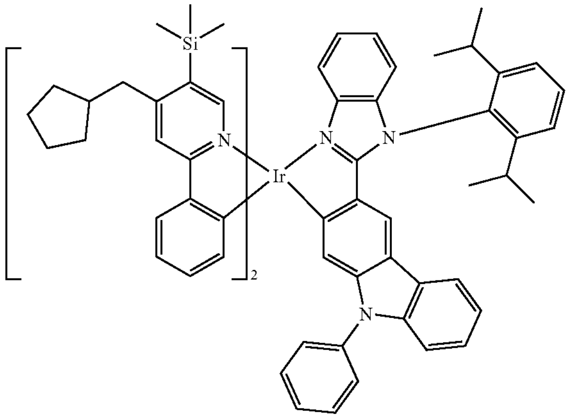
1099
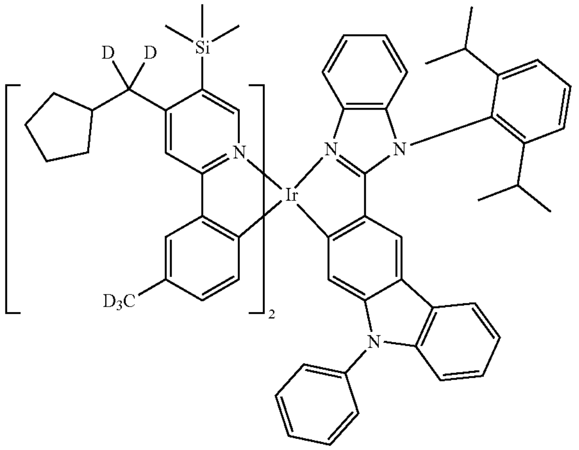
-continued
1100
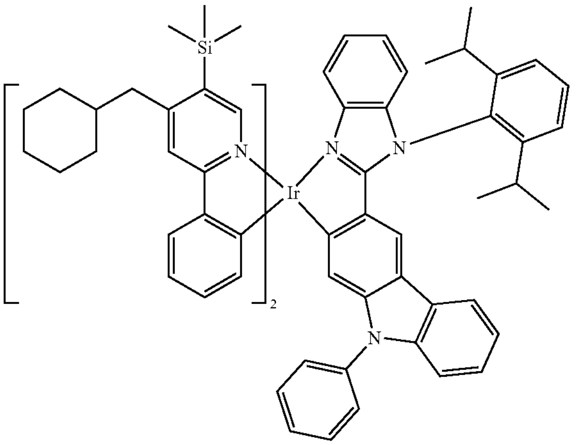
1101
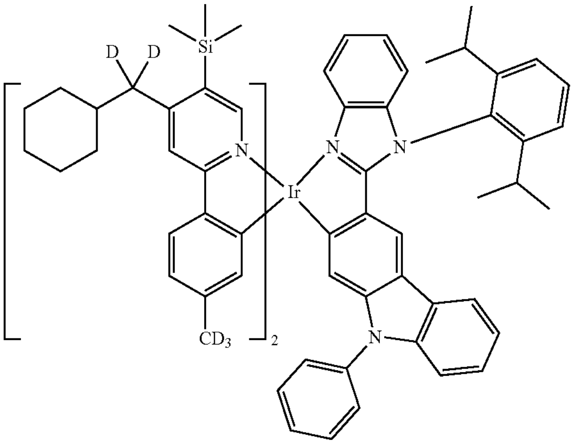
1102
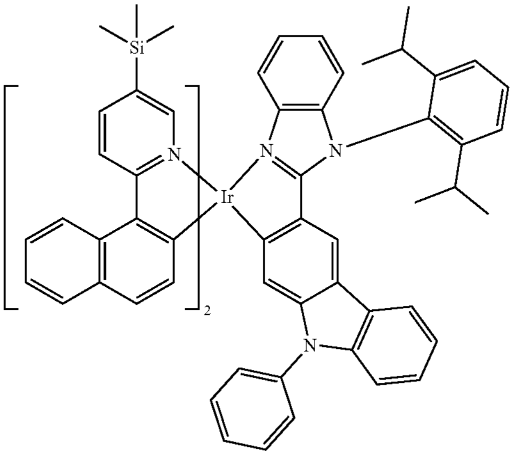

-continued
1103
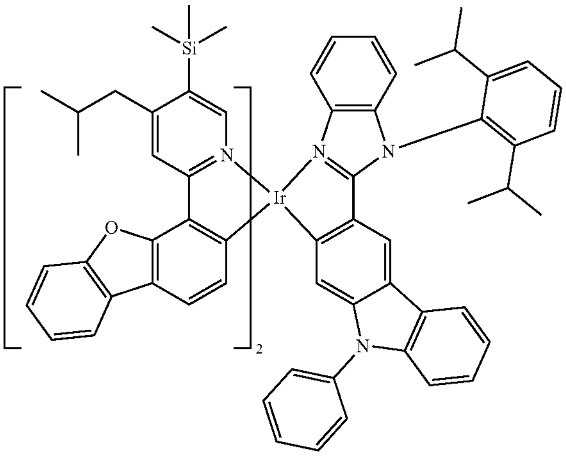
1104
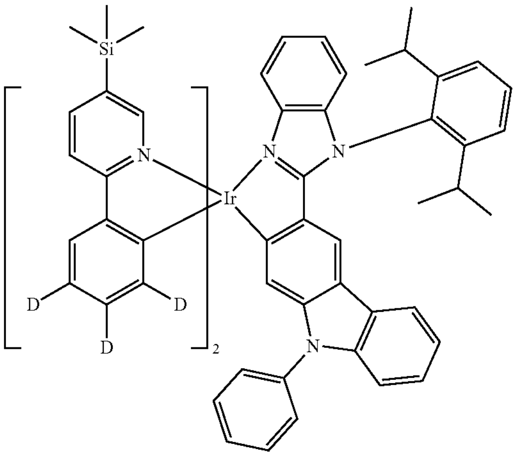
1105
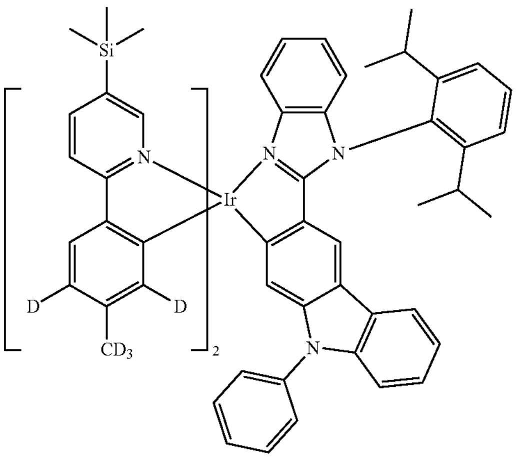
-continued
1106
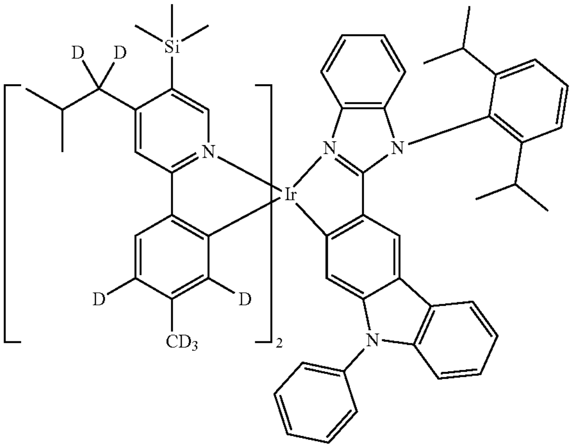
1107
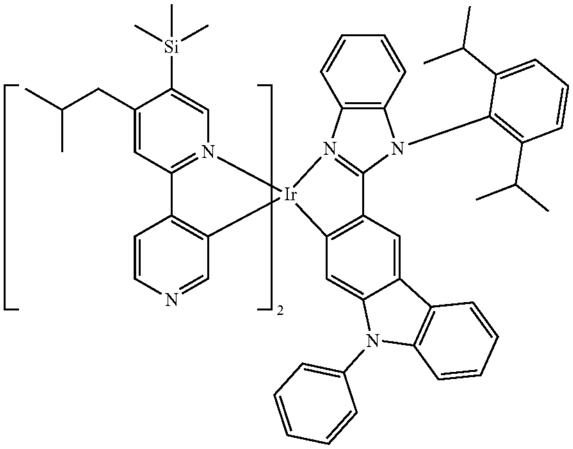
1108
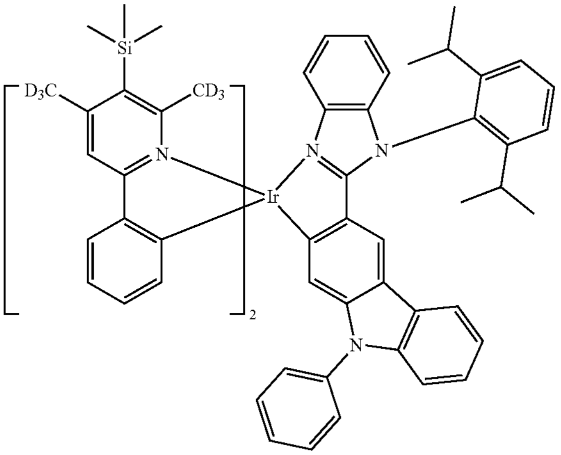

-continued
1109
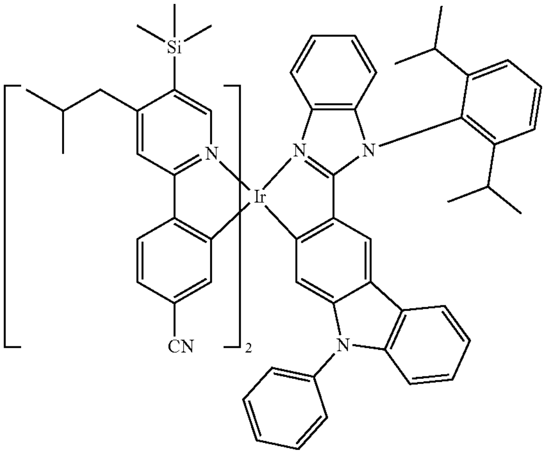
1110
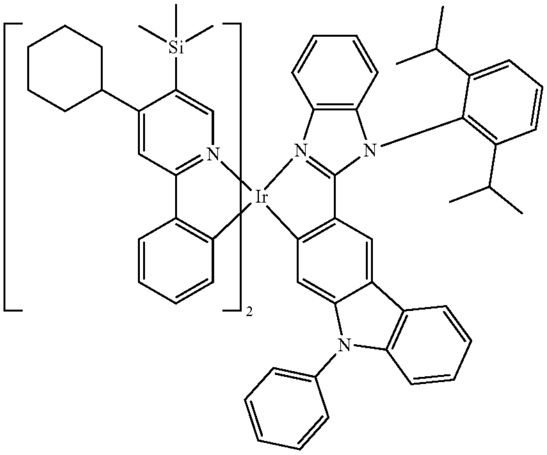
1111
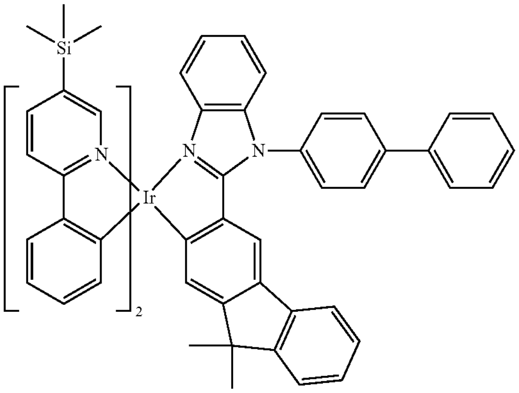
-continued
1112
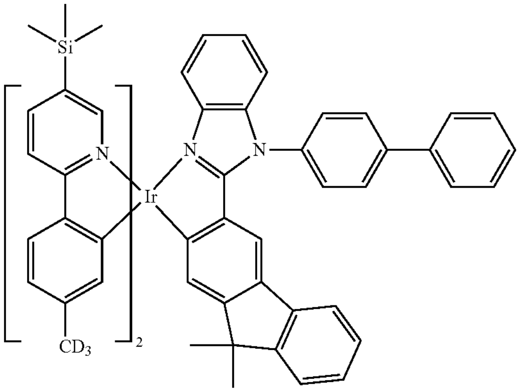
1113
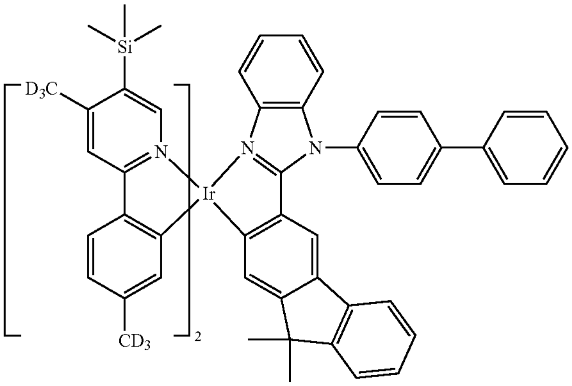
1114
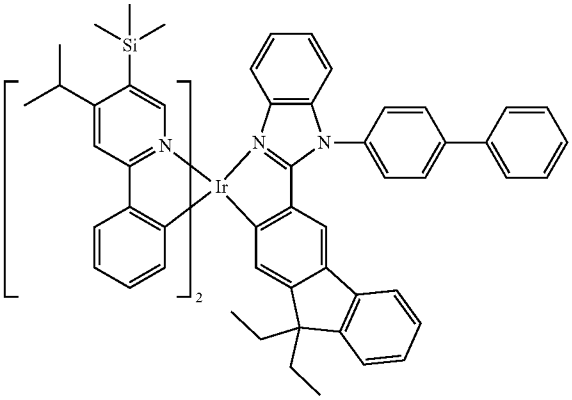
1115
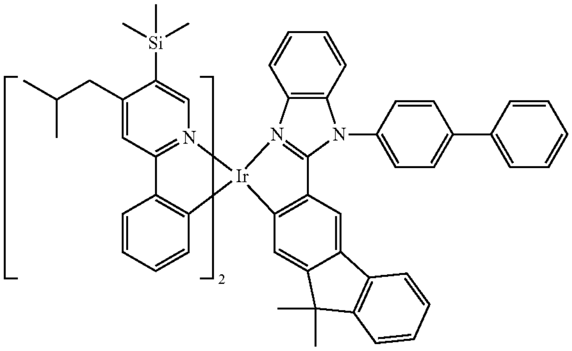

-continued
1116
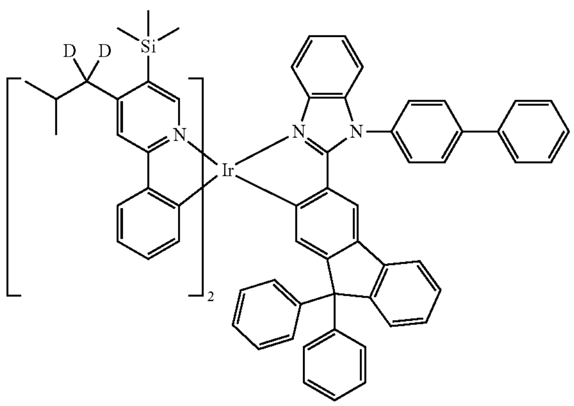
1117
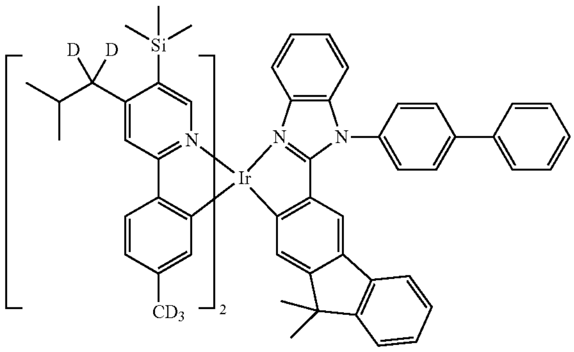
1118
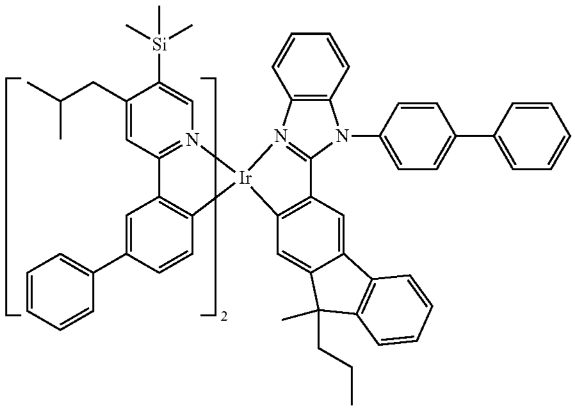
1119
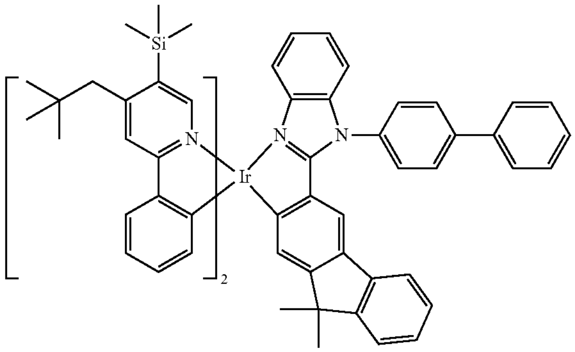
-continued
1120
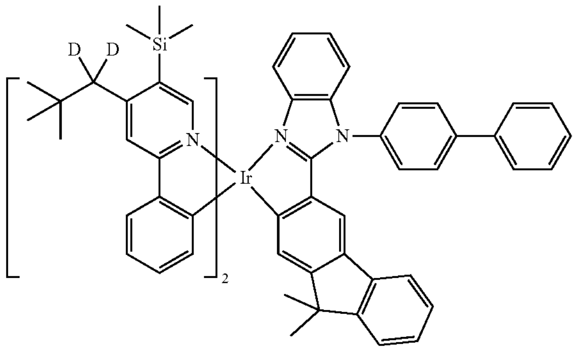
1121
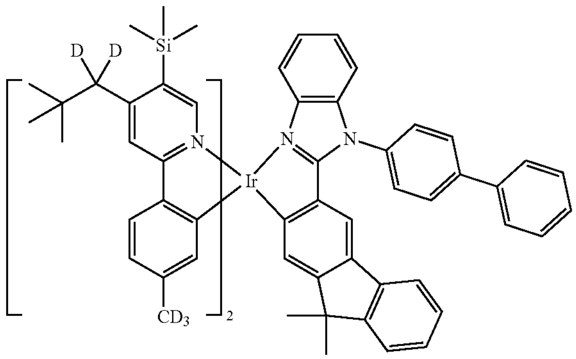
1122
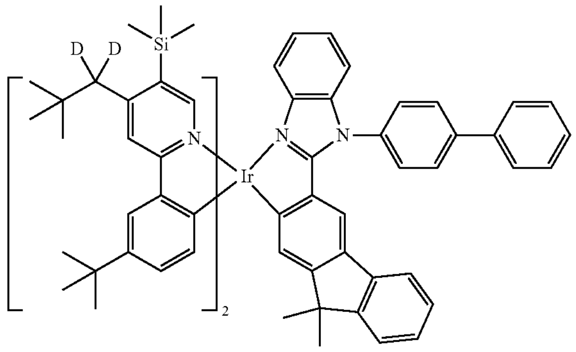
1123
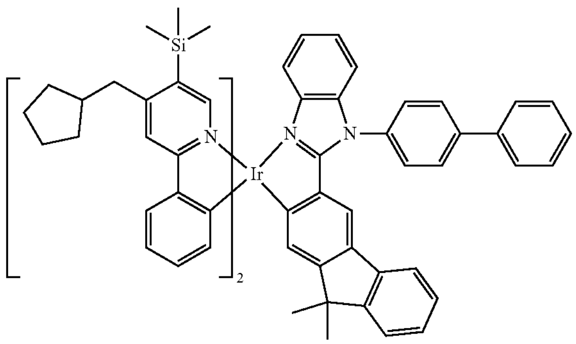

-continued
1124
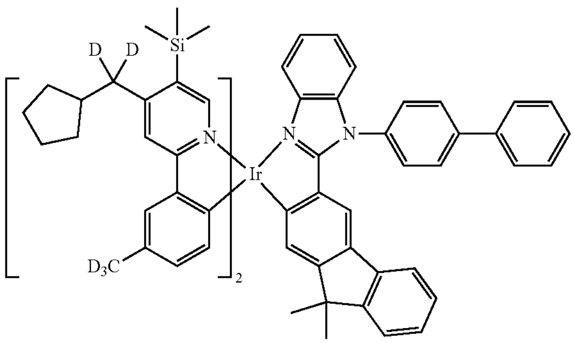
1125
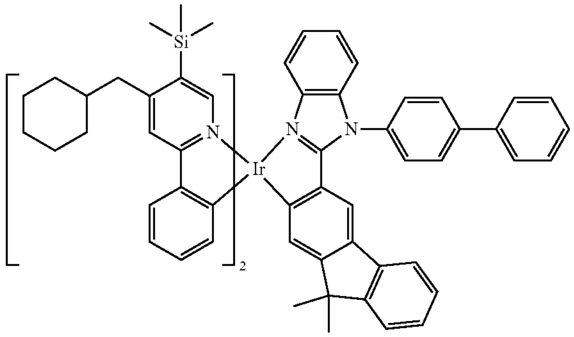
1126
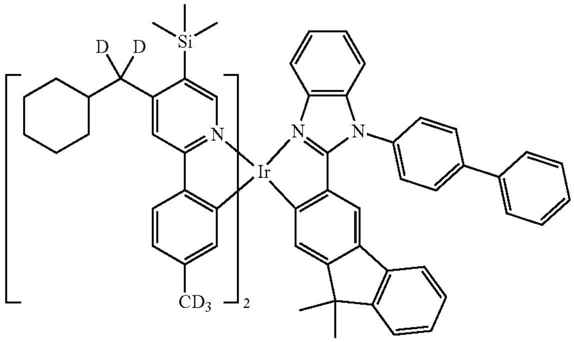
1127
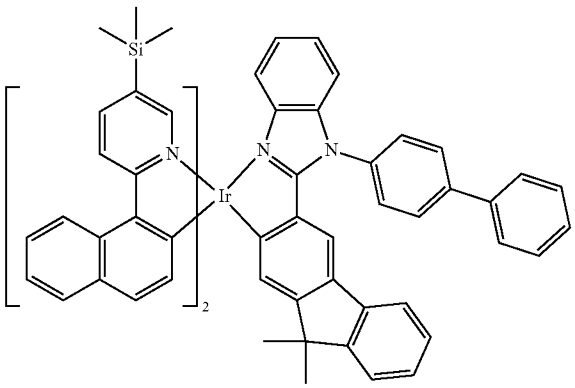
-continued
1128
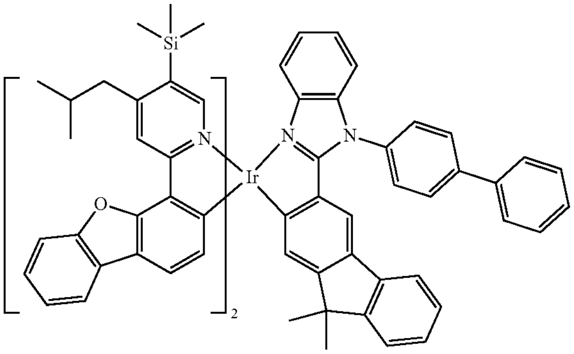
1129
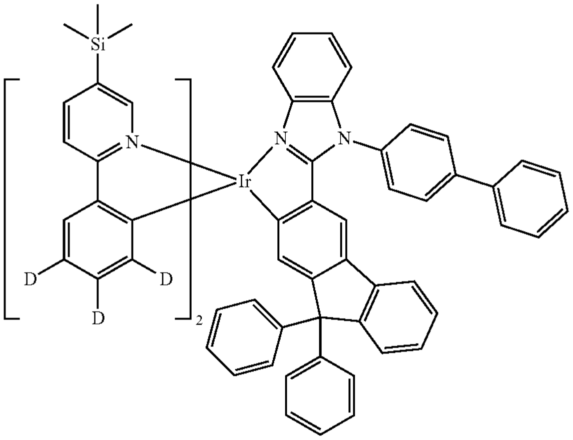
1130
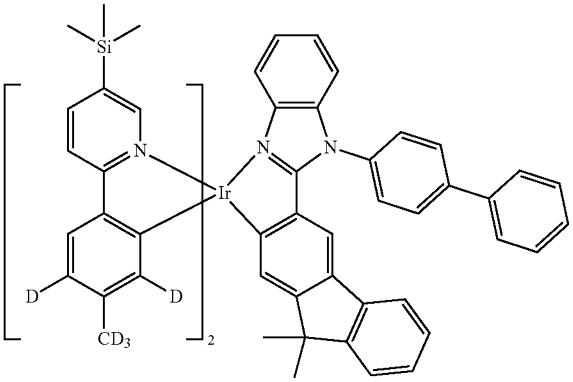
1131
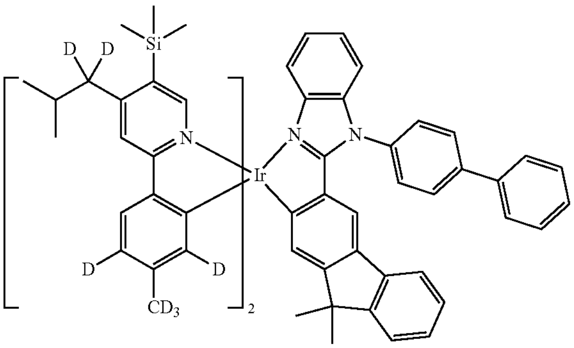

-continued
1132
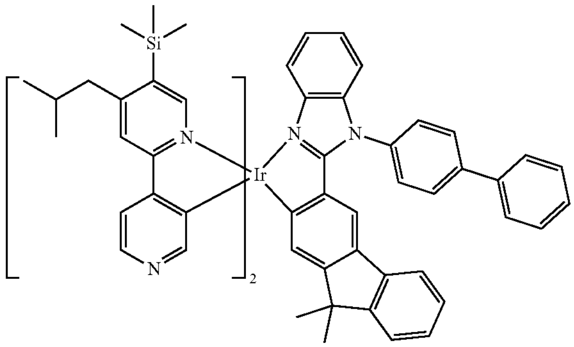
1133
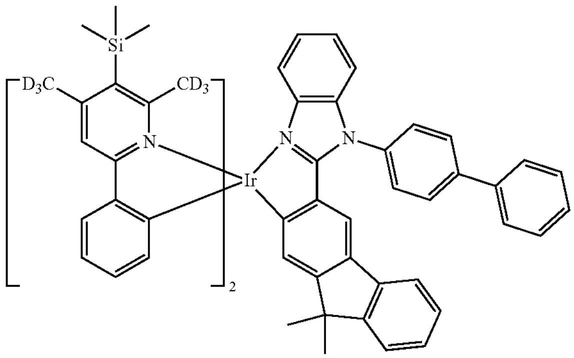
1134
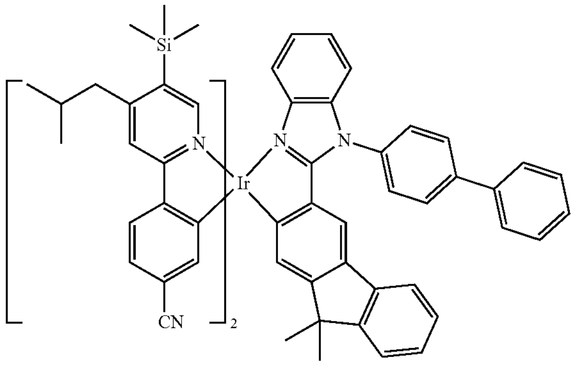
1135
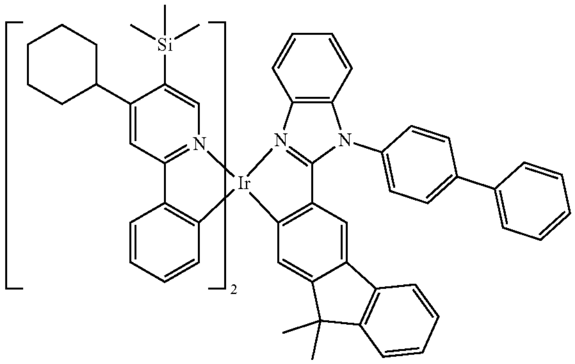
-continued
1136
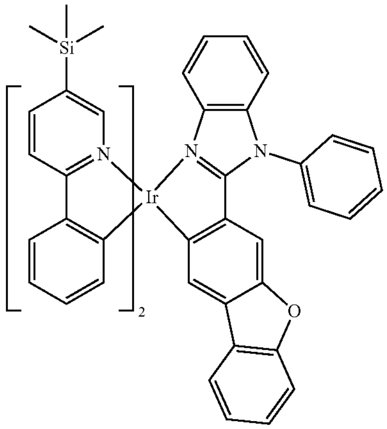
1137
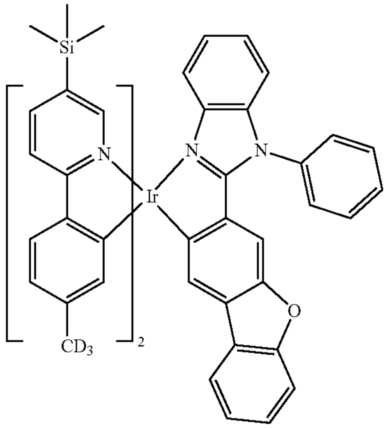
1138
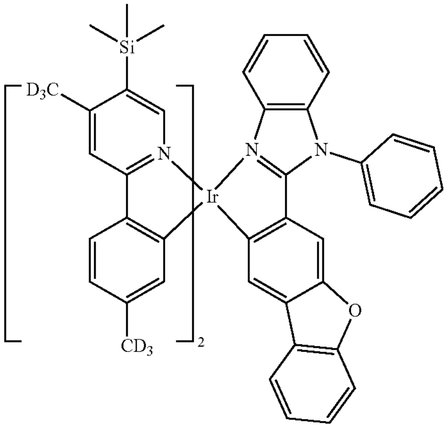

-continued
1139
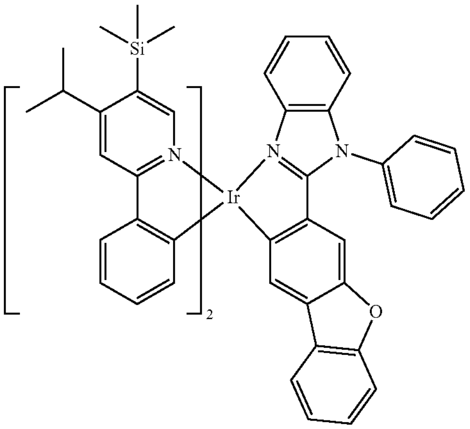
1140
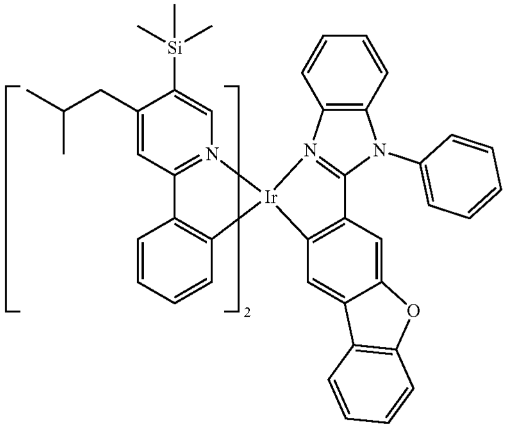
1141
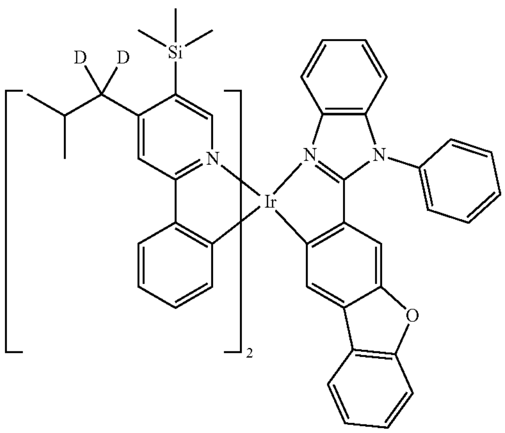
-continued
1142
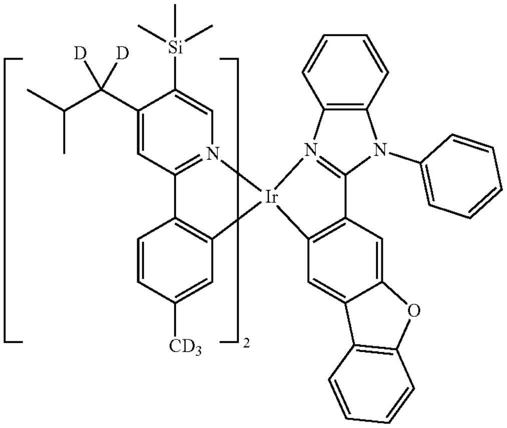
1143
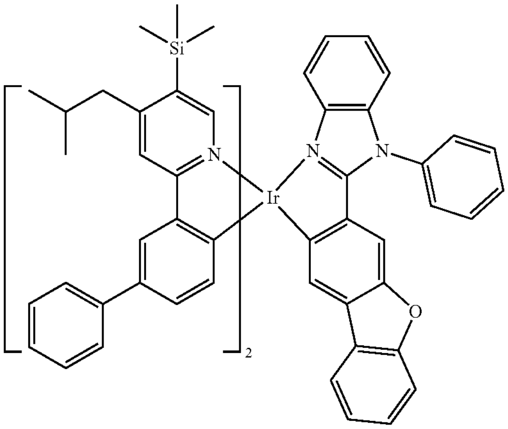
1153
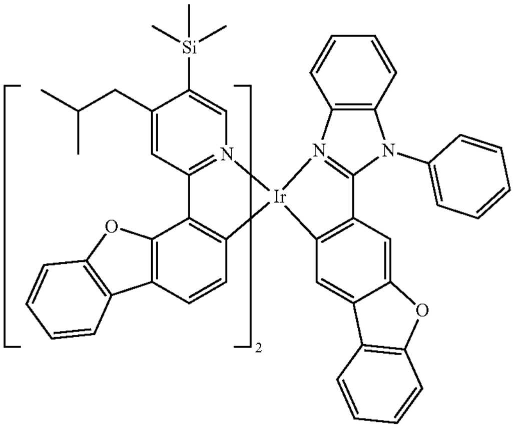

-continued
1154
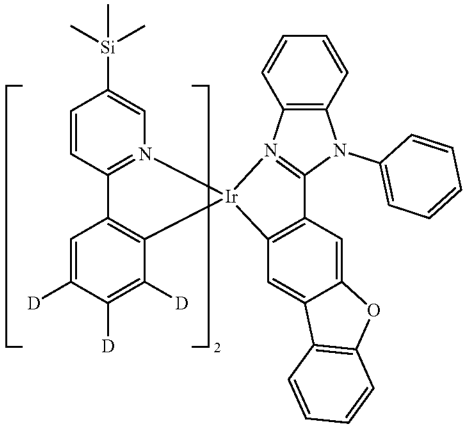
1155
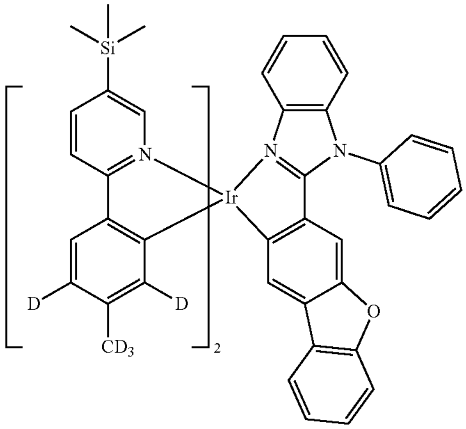
1156
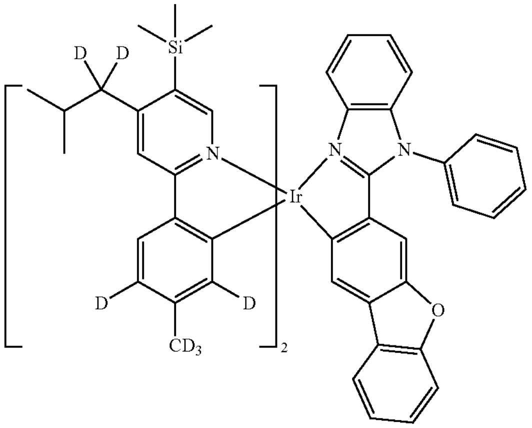
-continued
1157
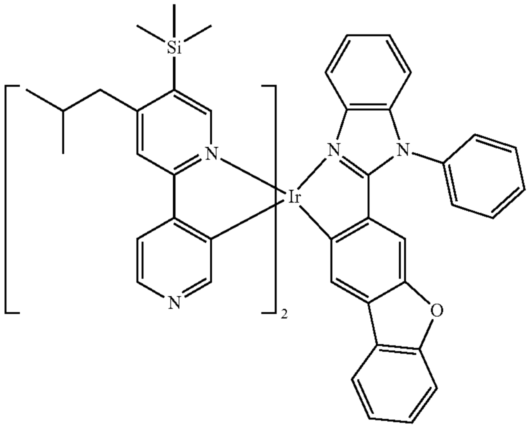
1158
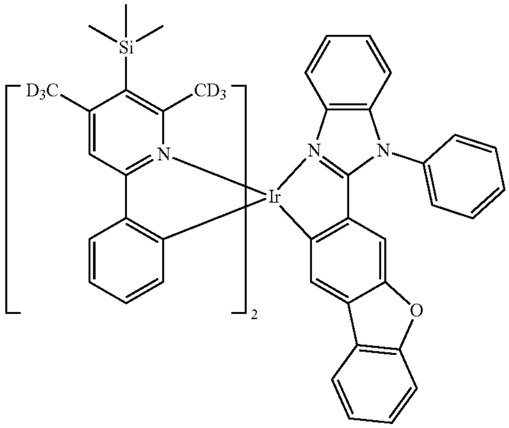
1159
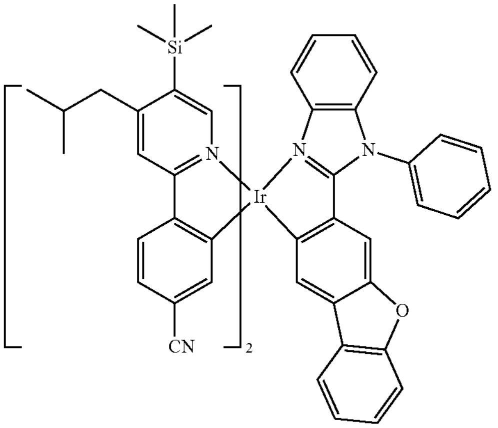

-continued
1160
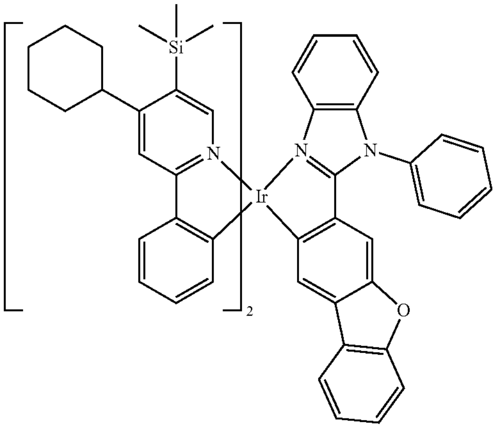
1161
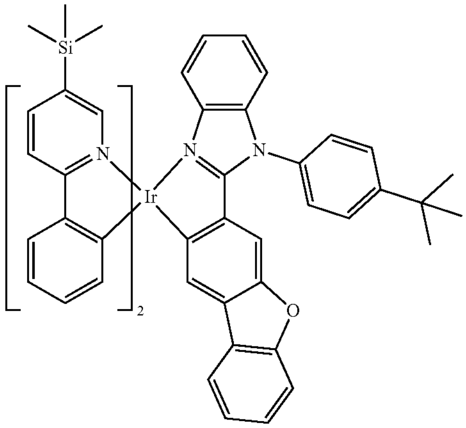
1144
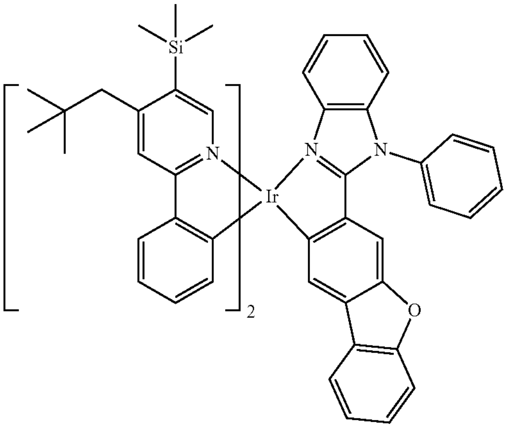
-continued
1145
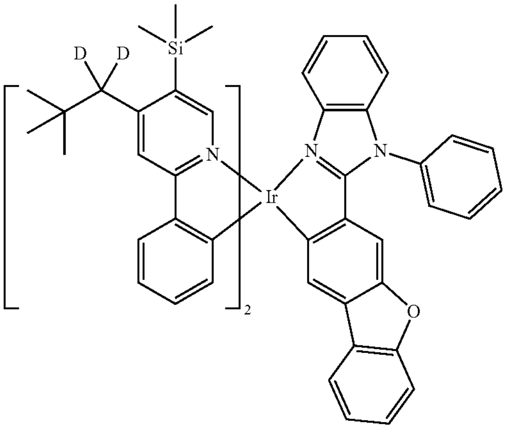
1146
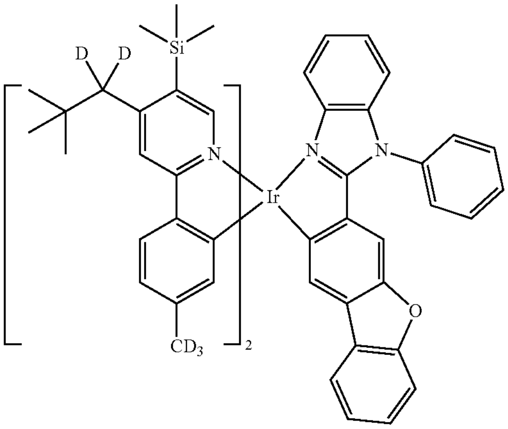
1147
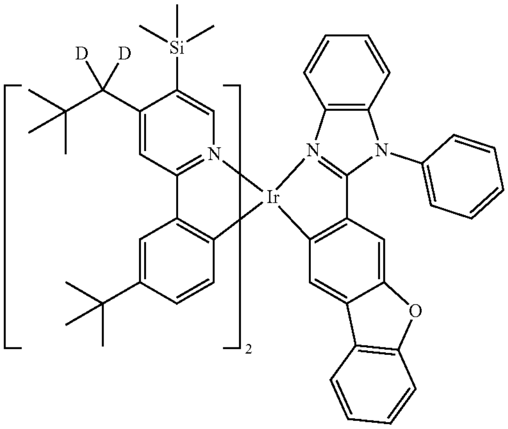

-continued
1148
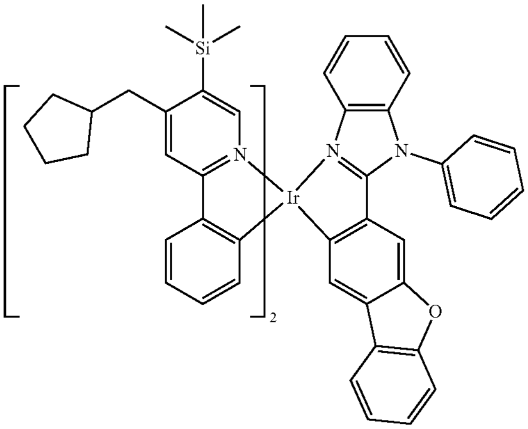
1149
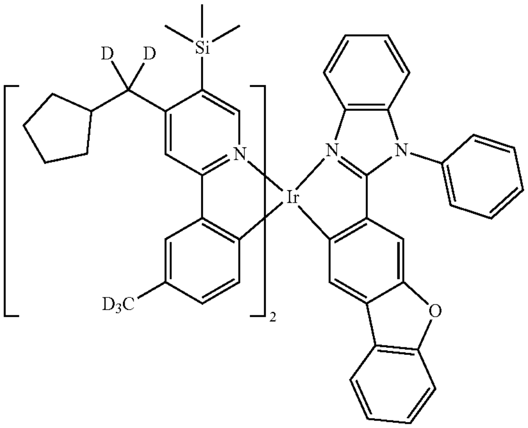
1150
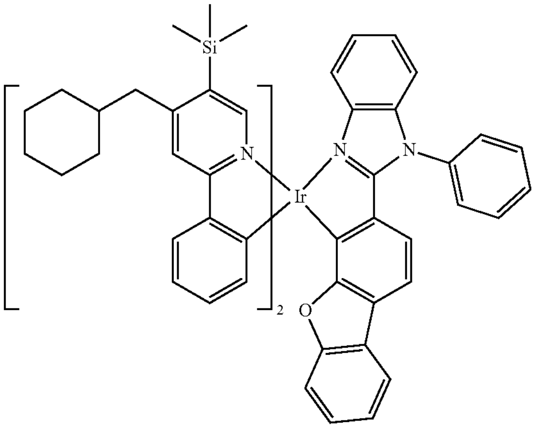
-continued
1151
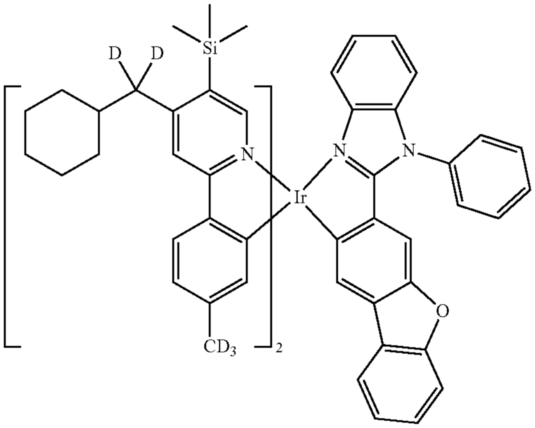
1152
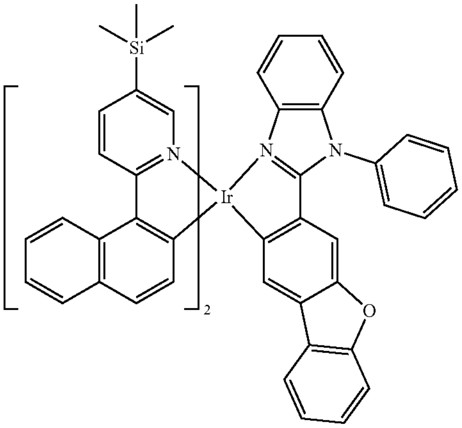
1162
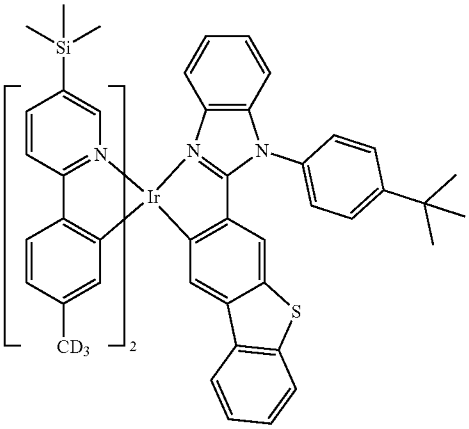

-continued
1163
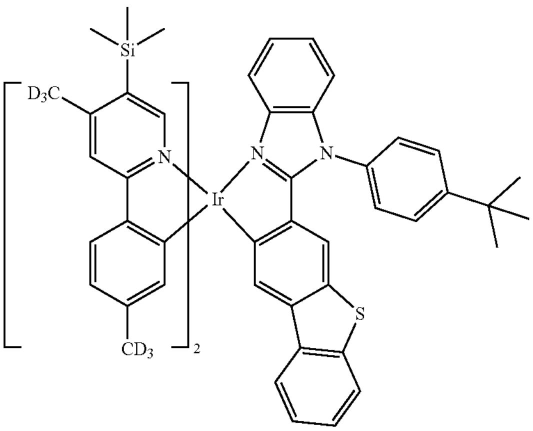
1164
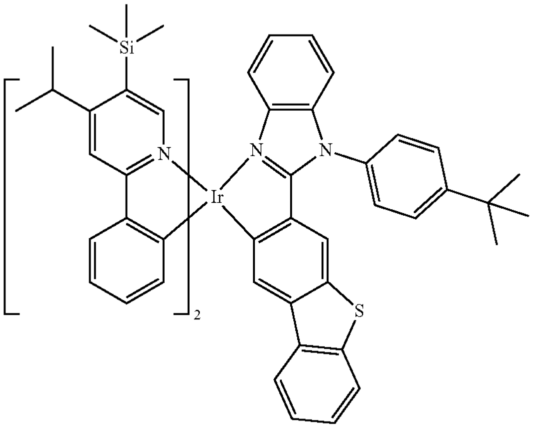
1165
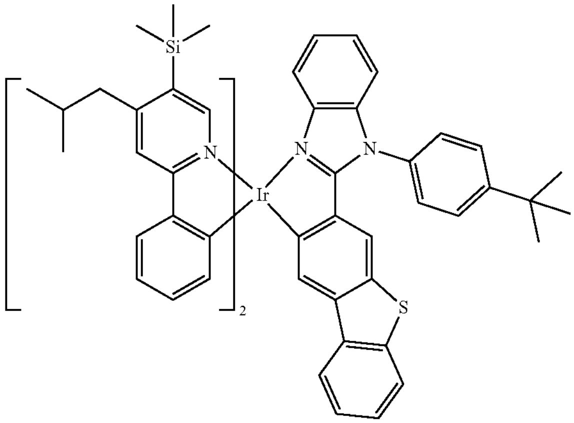
-continued
1166
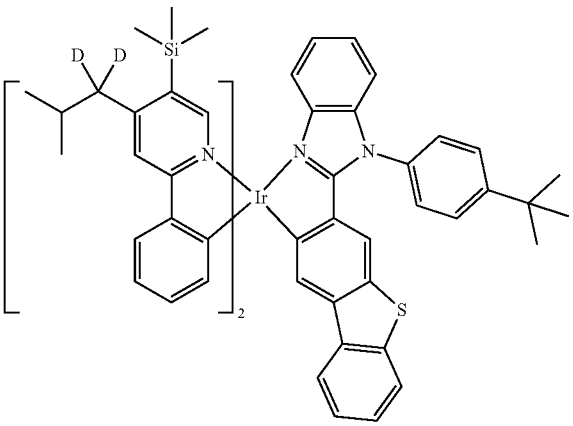
1167
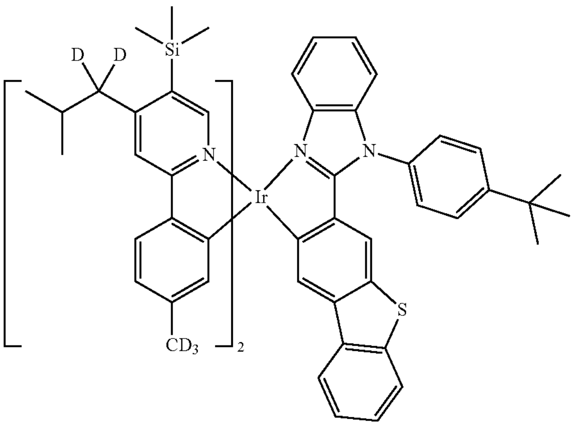
1168
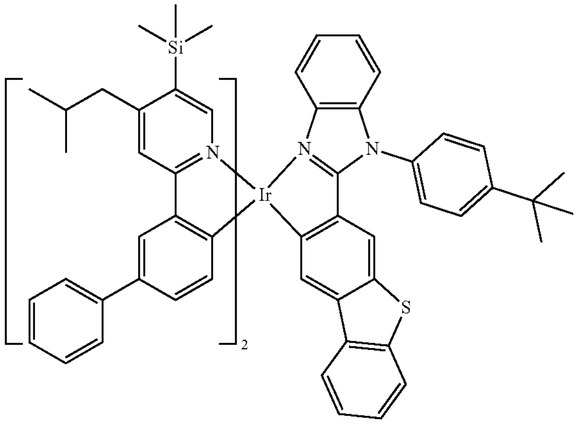

-continued
1169
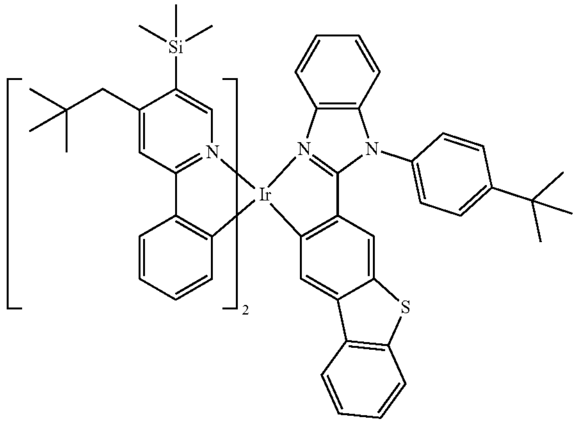
1170
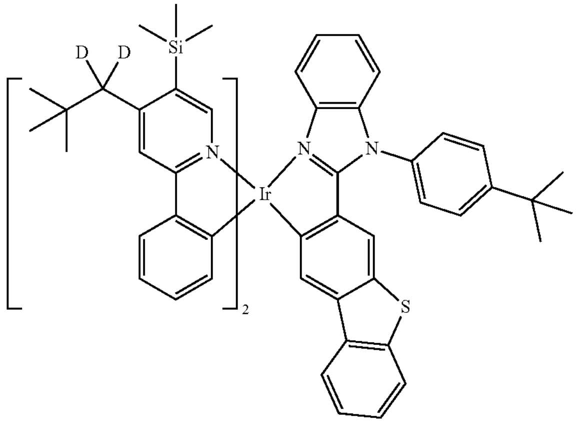
1171
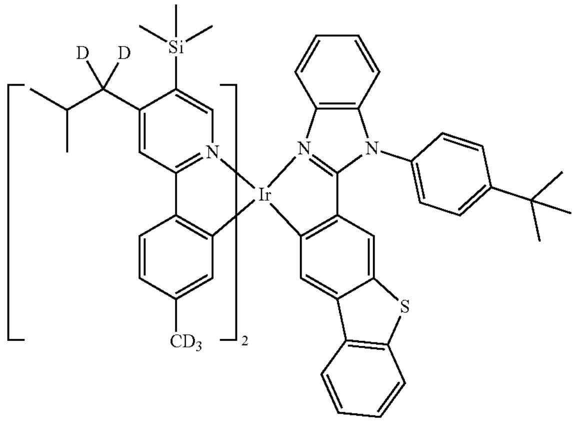
-continued
1172
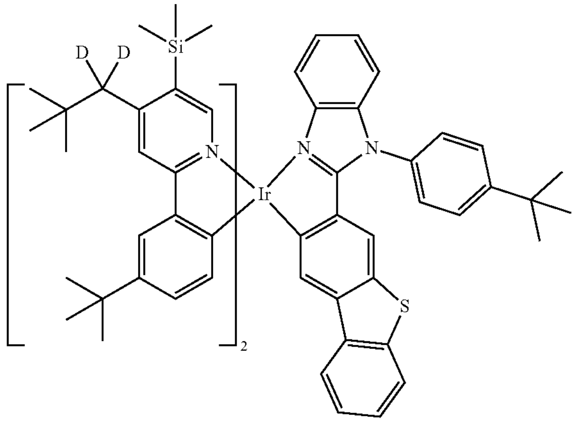
1173
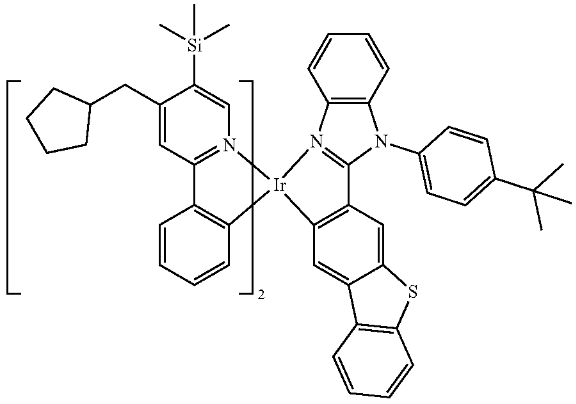
1174
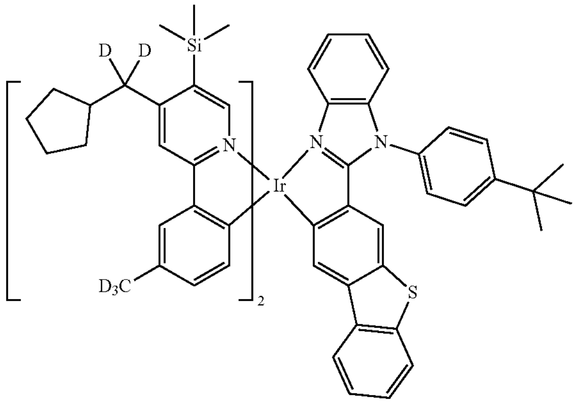

-continued
1175
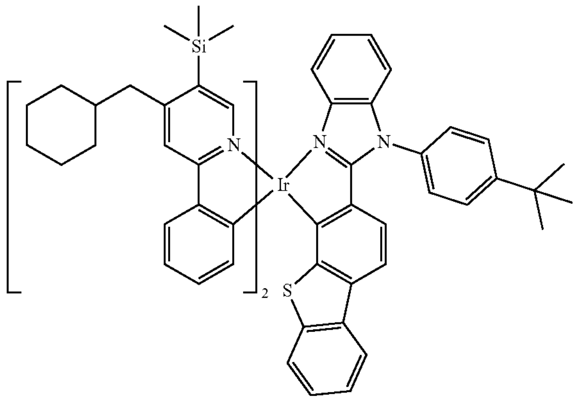
1176
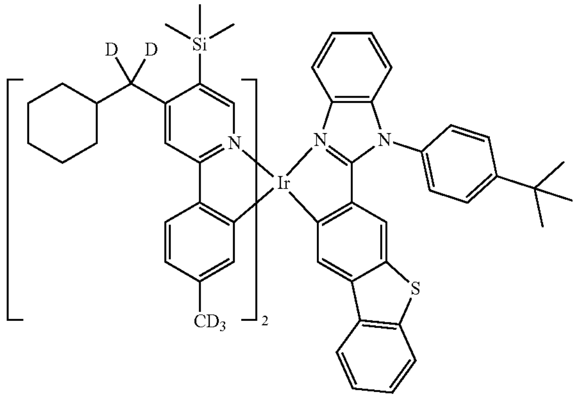
1177
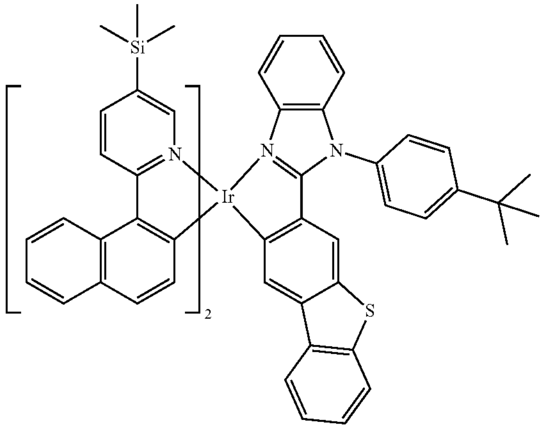
-continued
1178
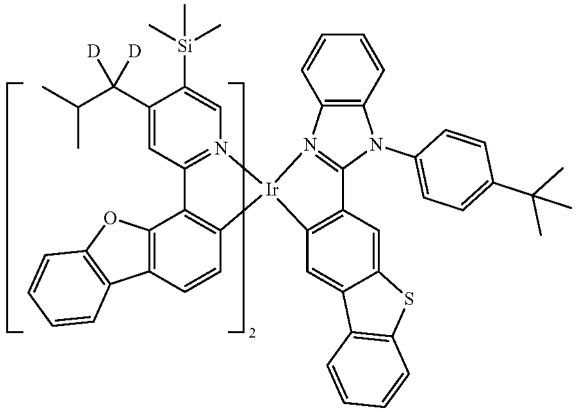
1179
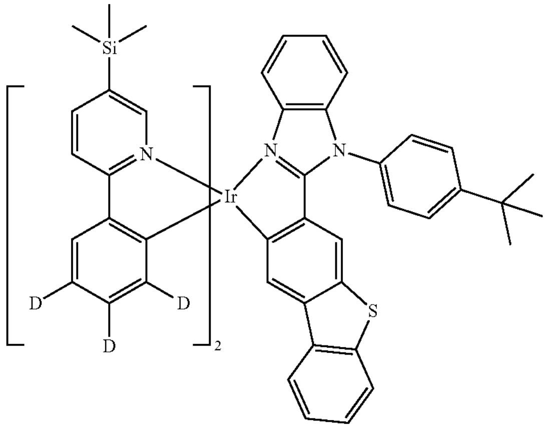
1180
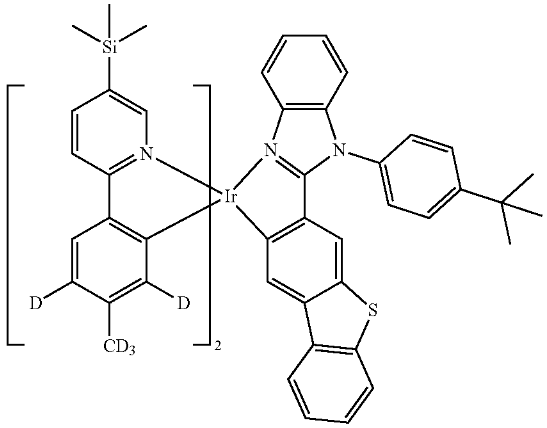

-continued
1181
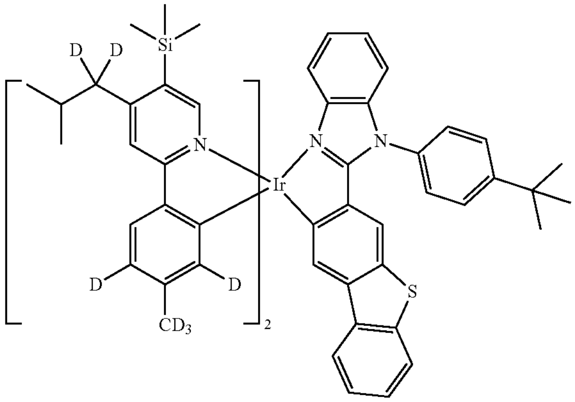
1182
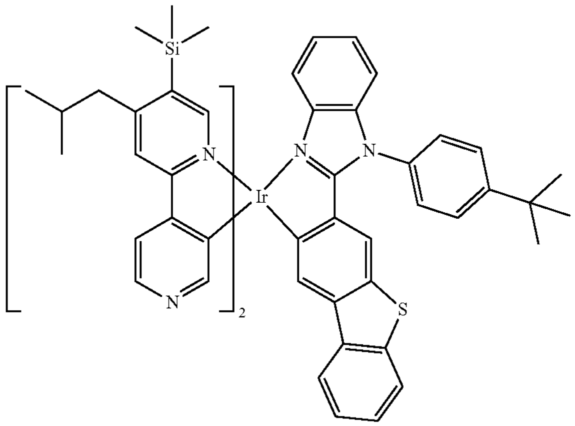
1183
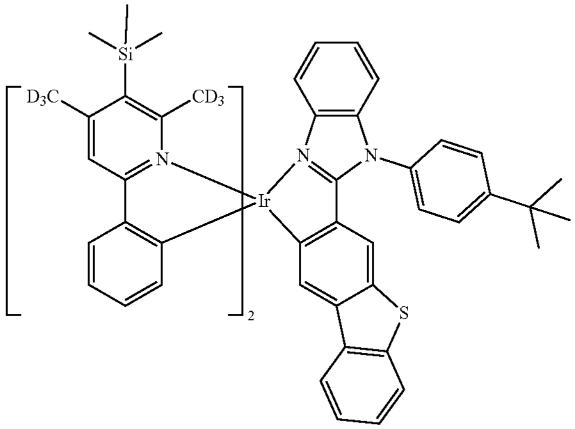
-continued
1184
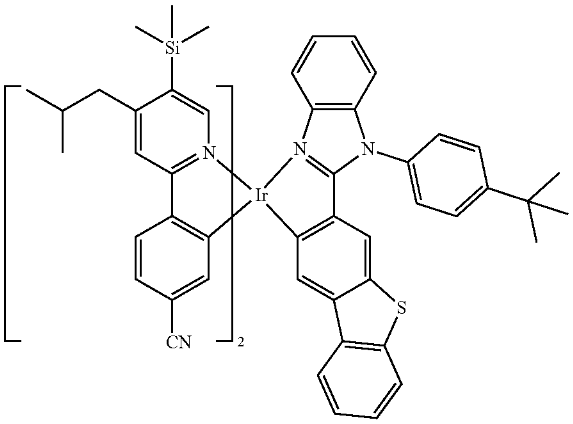
1185
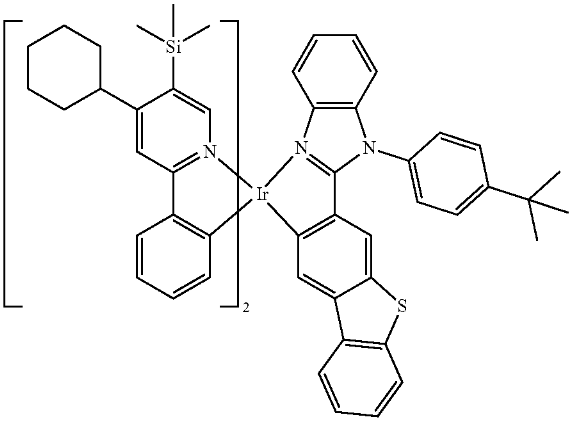
1186
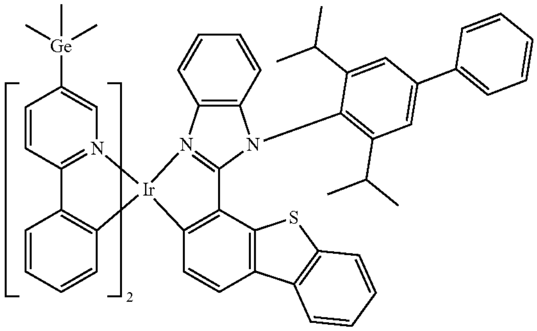
1187
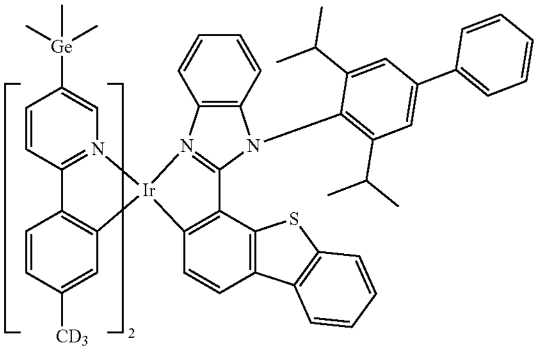

-continued
1188
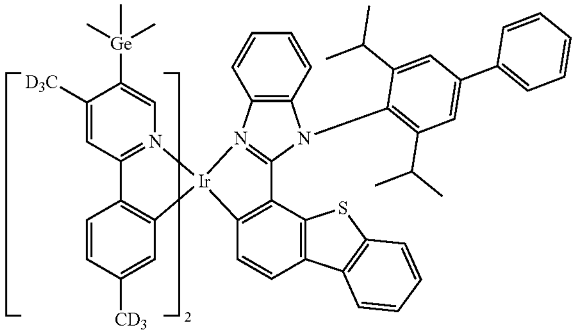
1189
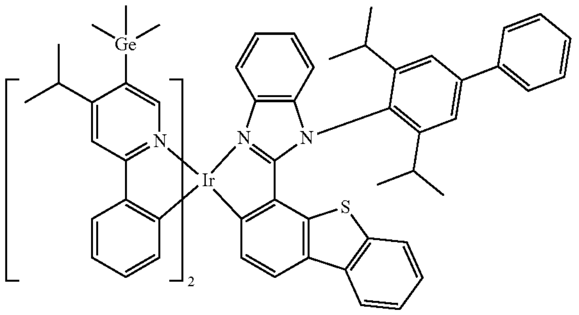
1190
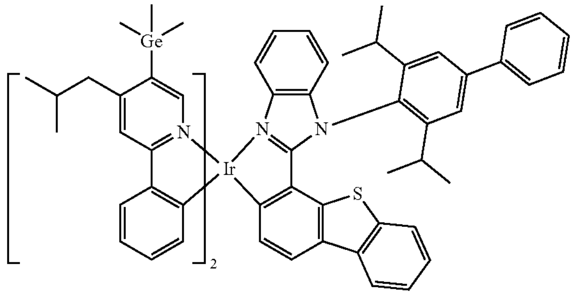
1191
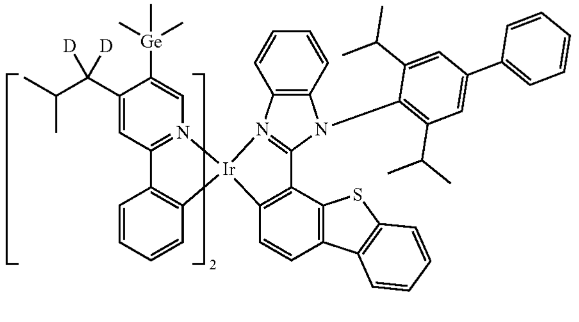
-continued
1192
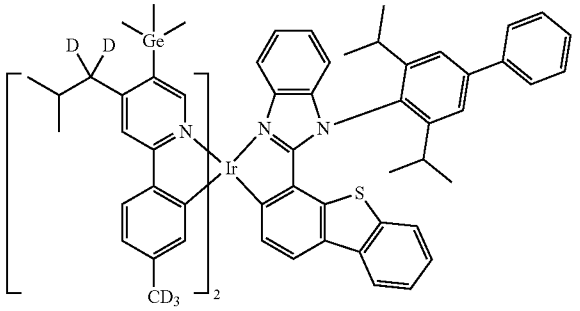
1193
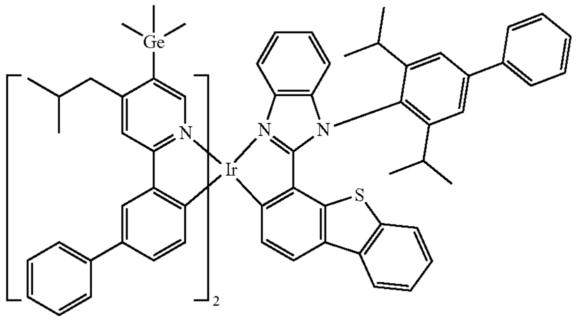
1194
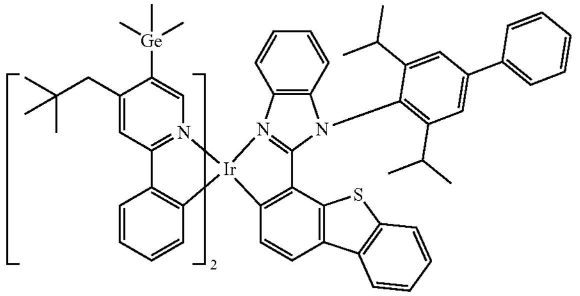
1195
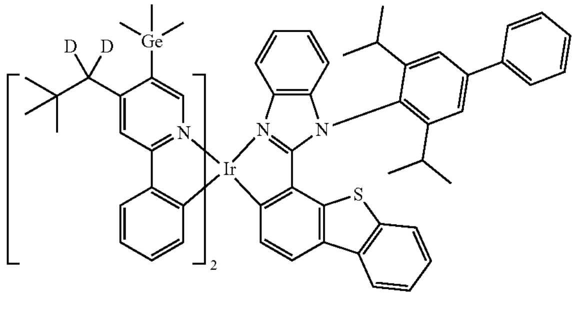

-continued
1196
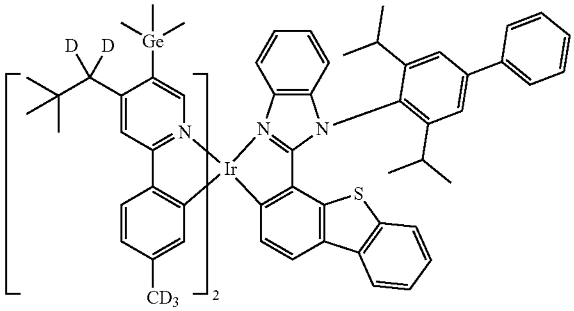
1197
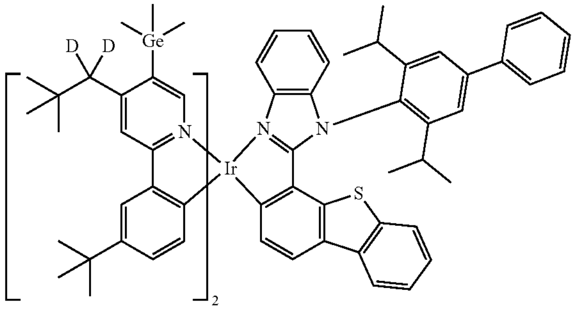
1198
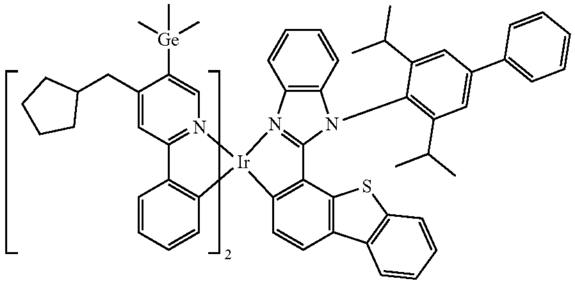
1199
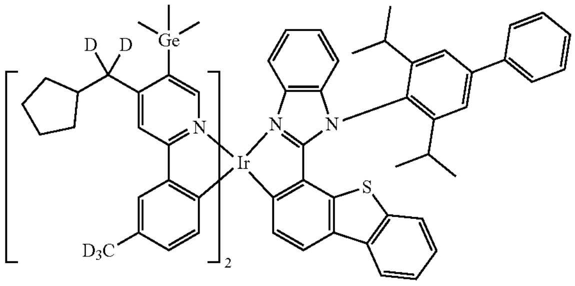
1200
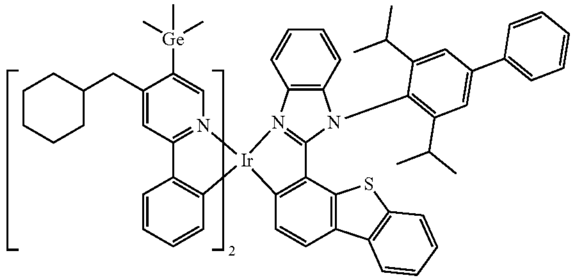
-continued
1201
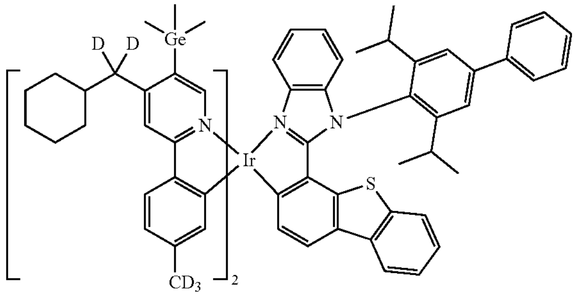
1202
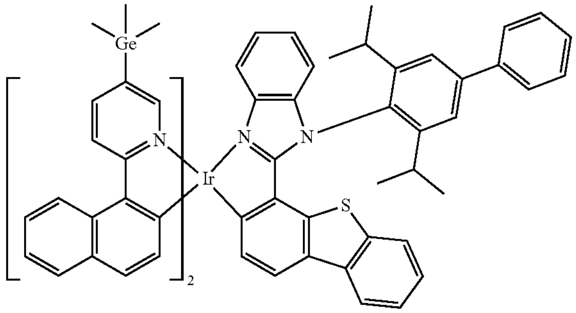
1203
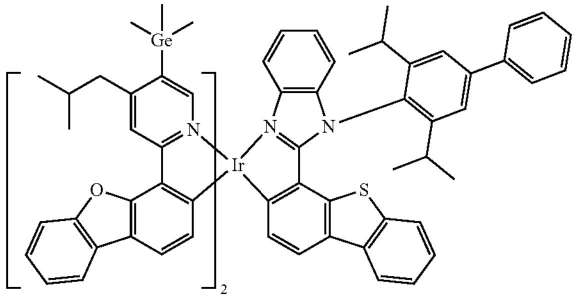
1204
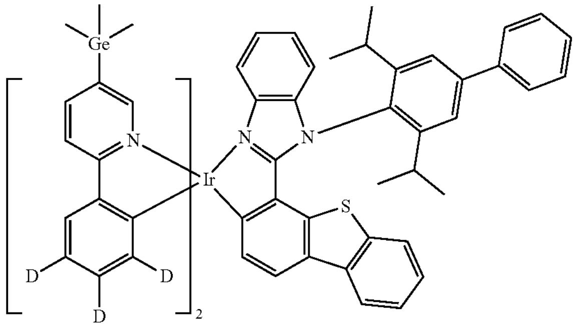

-continued
1205
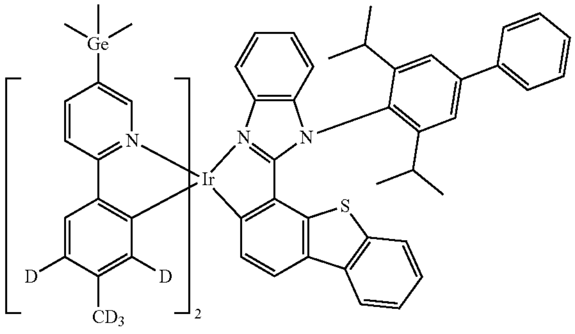
1206
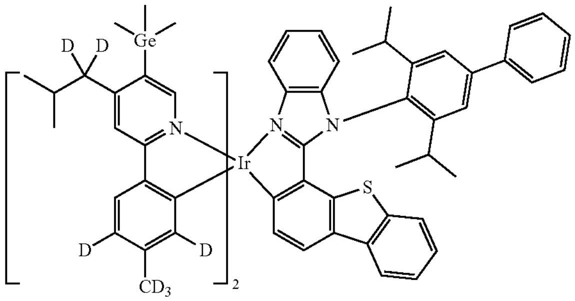
1207
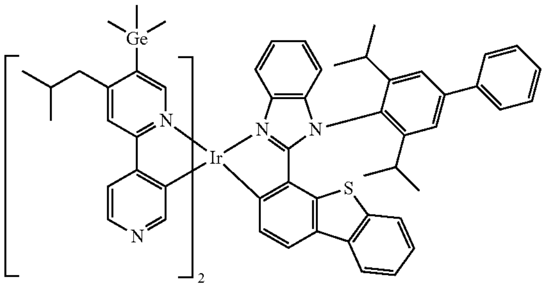
1208
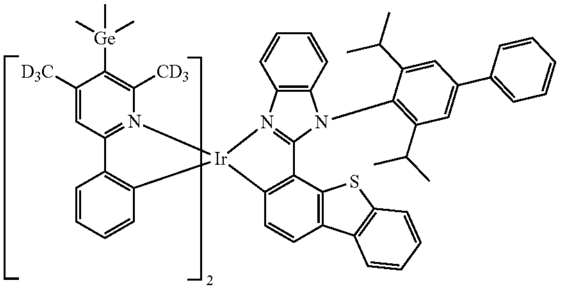
-continued
1209
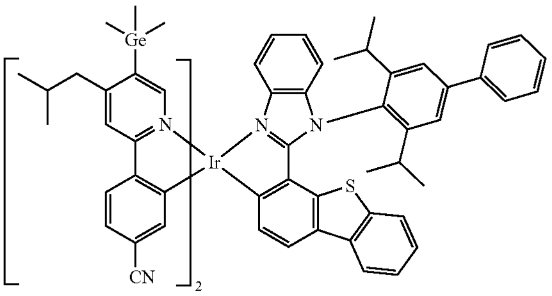
1210
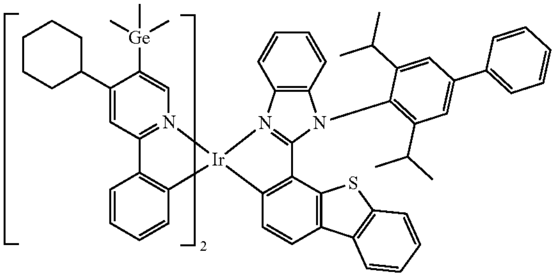
1211
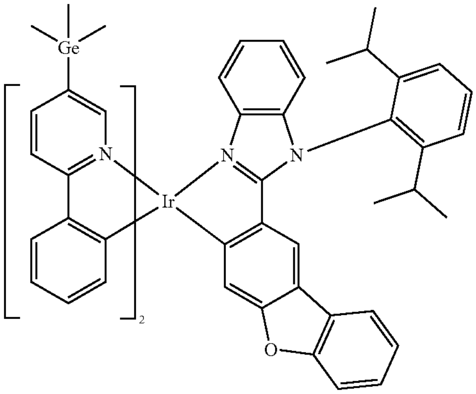
1212
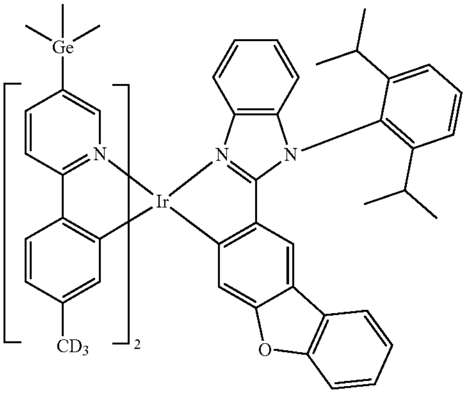

-continued
1213
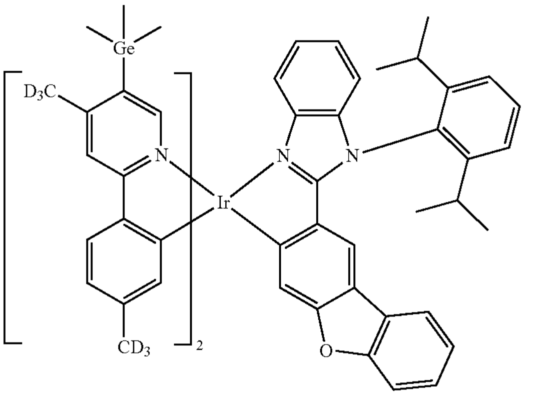
1214
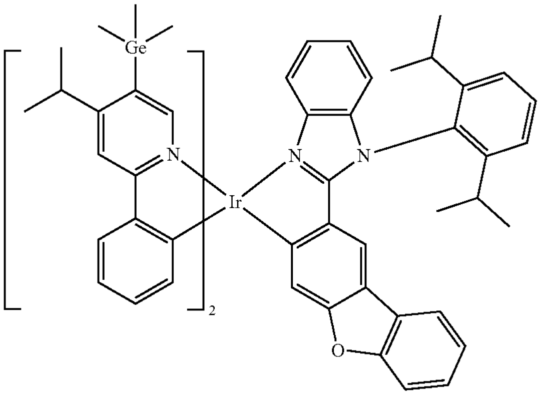
1215
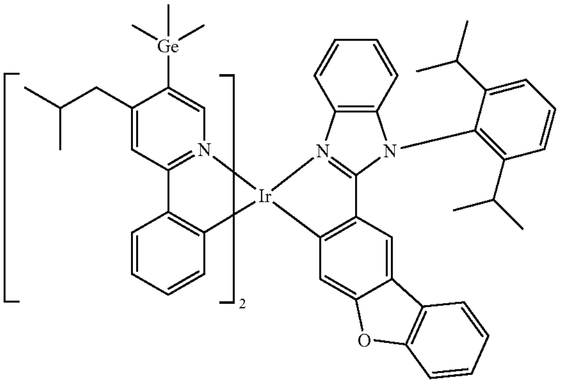
1216
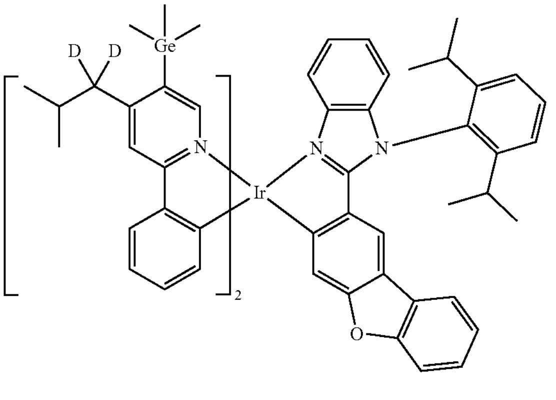
-continued
1217
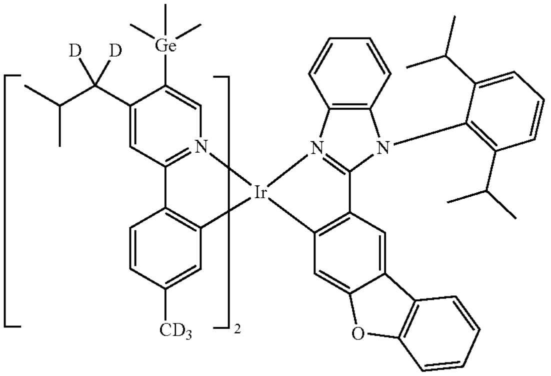
1218
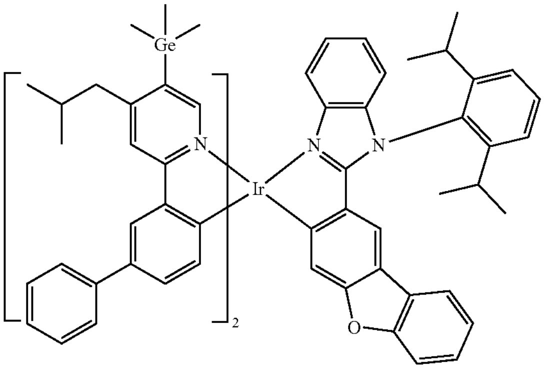
1219
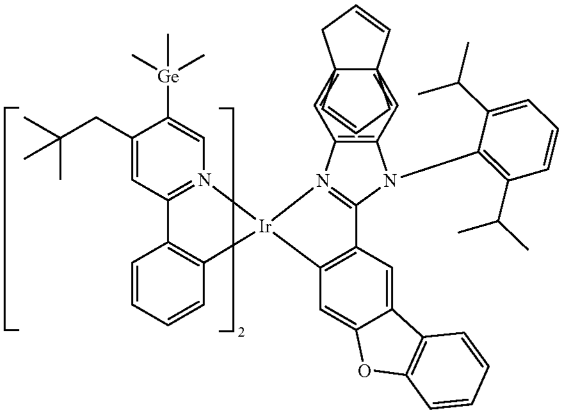
1220
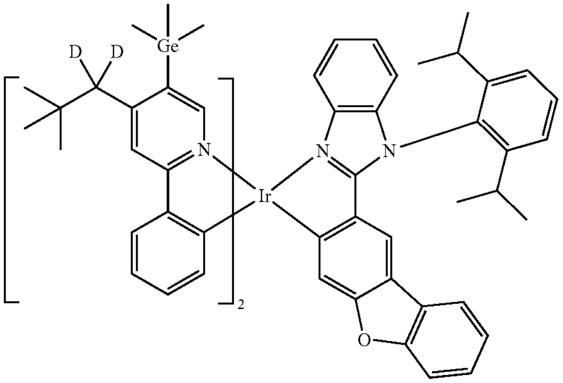

-continued
1221
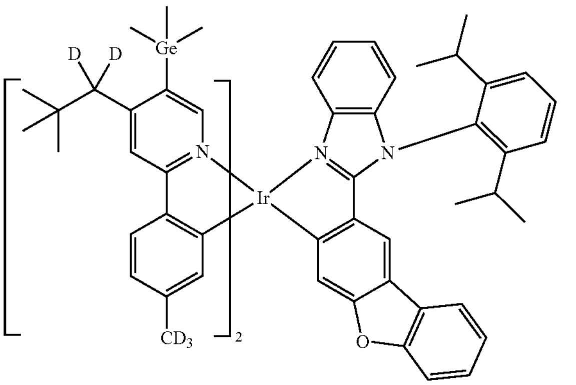
1222
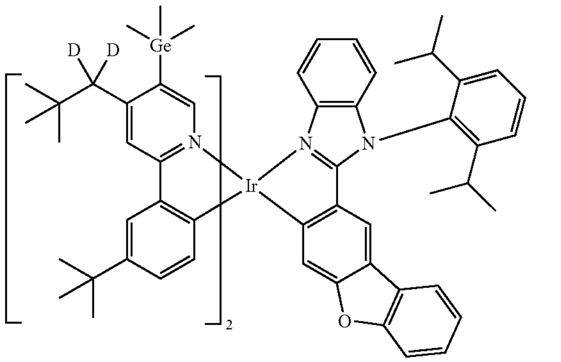
1223
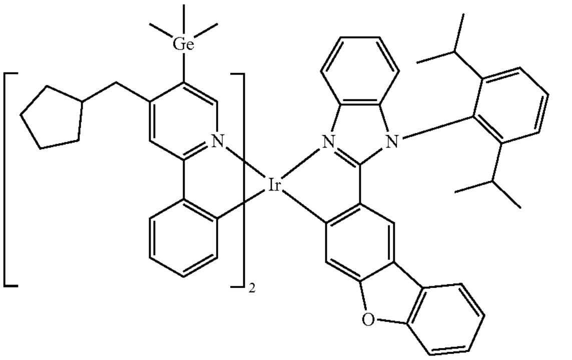
1224
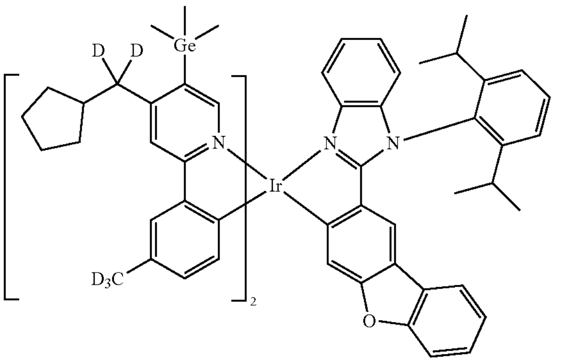
-continued
1225
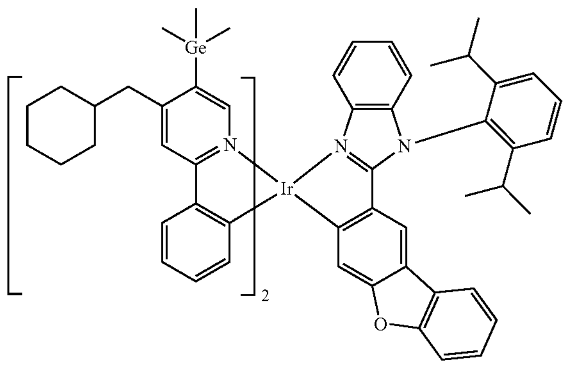
1226
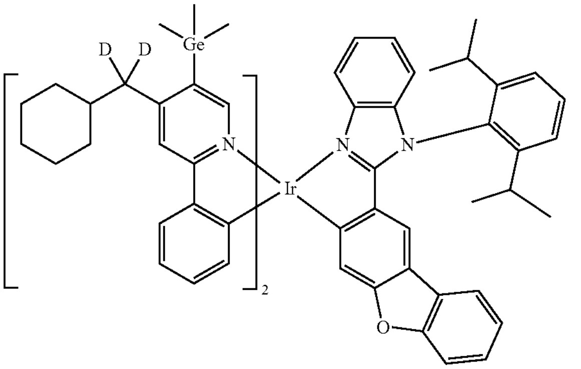
1227
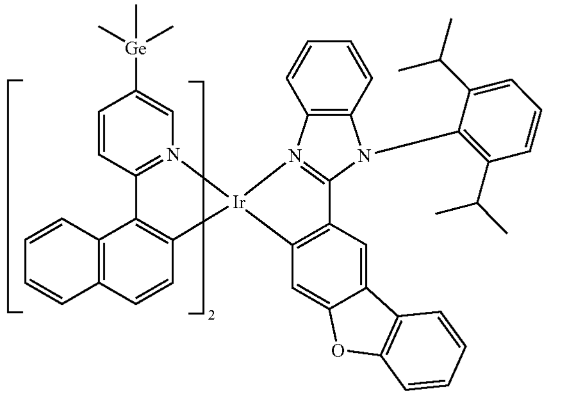
1228
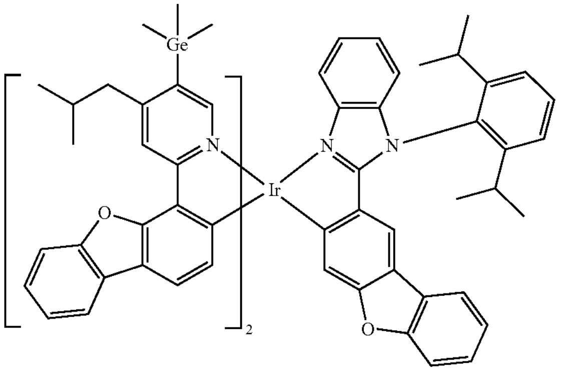

-continued
1229
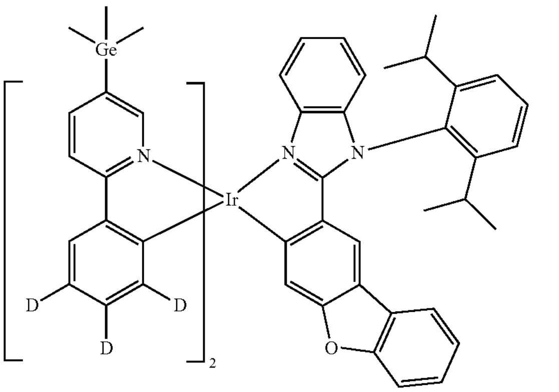
1230
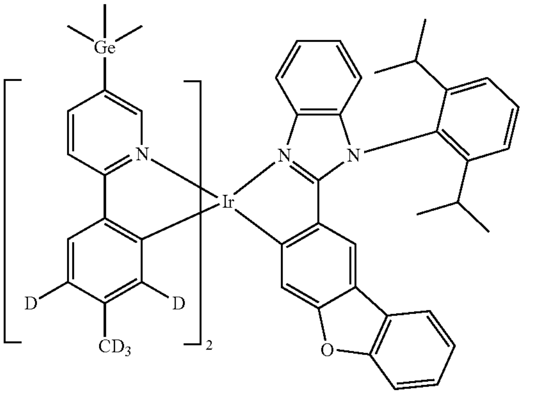
1231
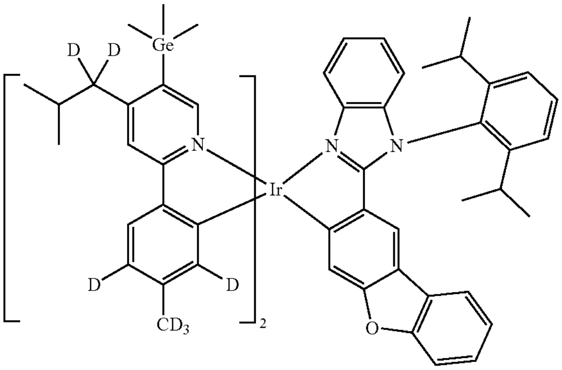
1232
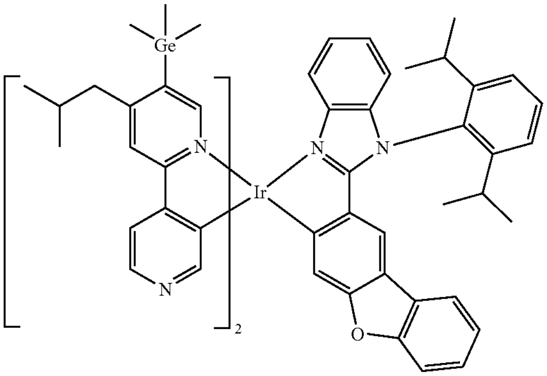
-continued
1233
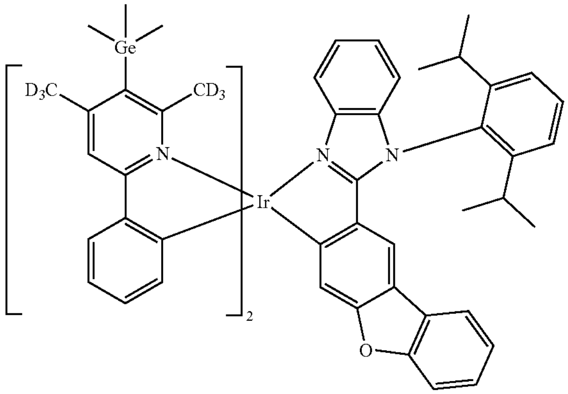
1234
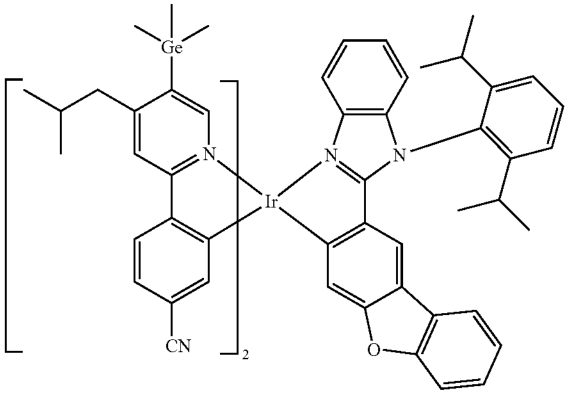
1235
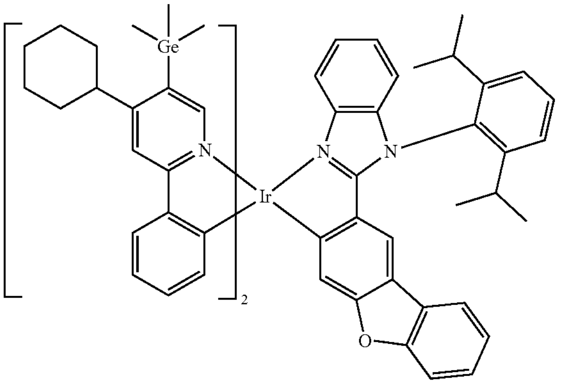
1236
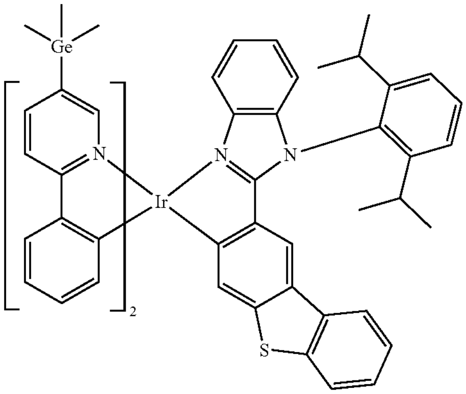

-continued
1237
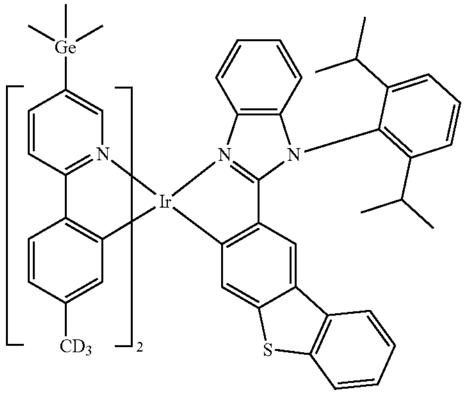
1238
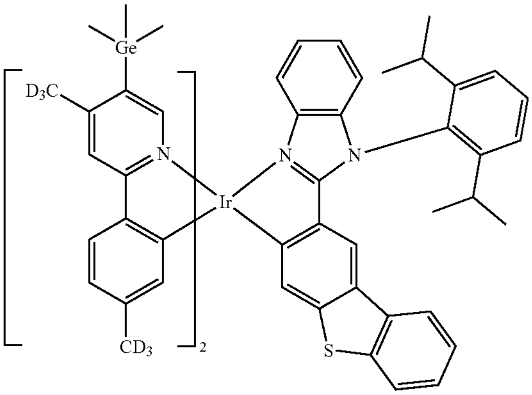
1239
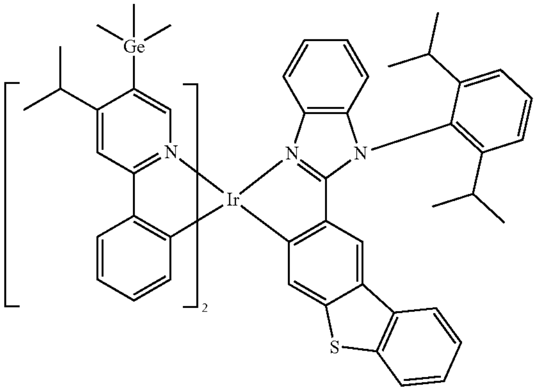
1240
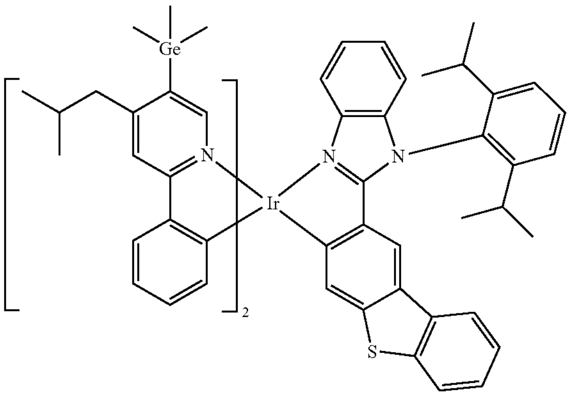
-continued
1241
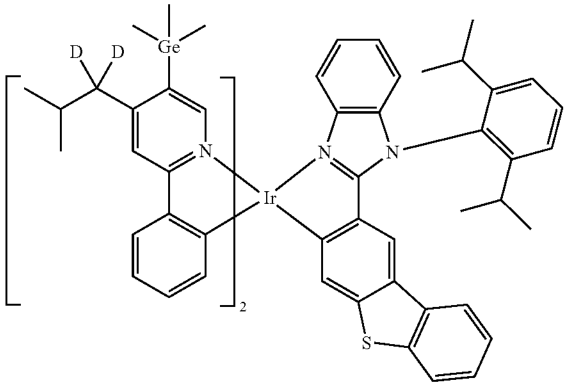
1242
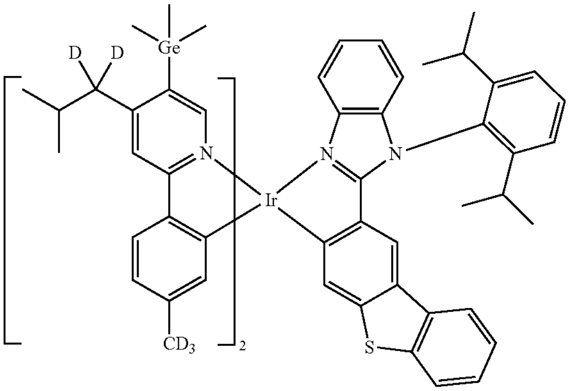
1243
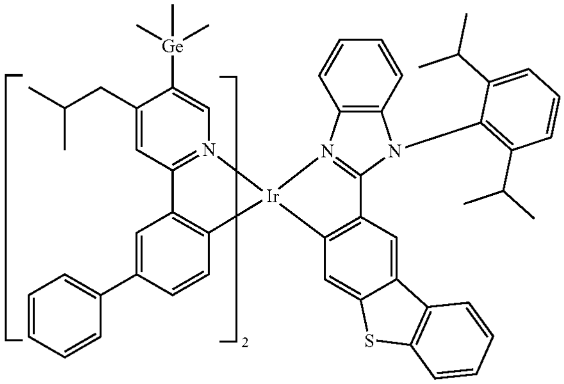
1244
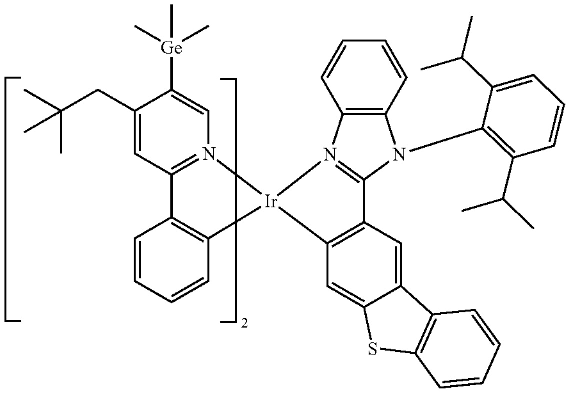

-continued
1245
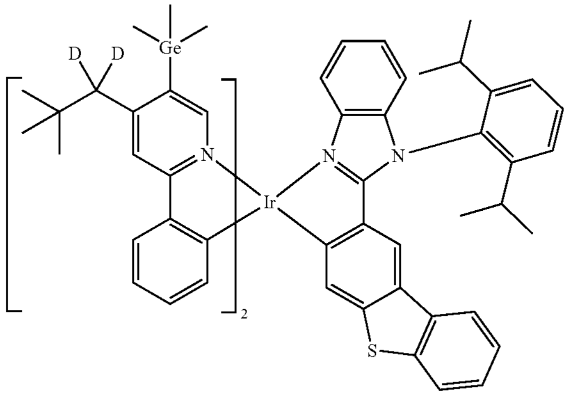
1246
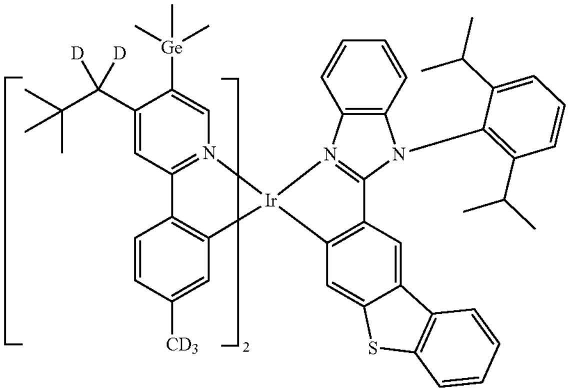
1247
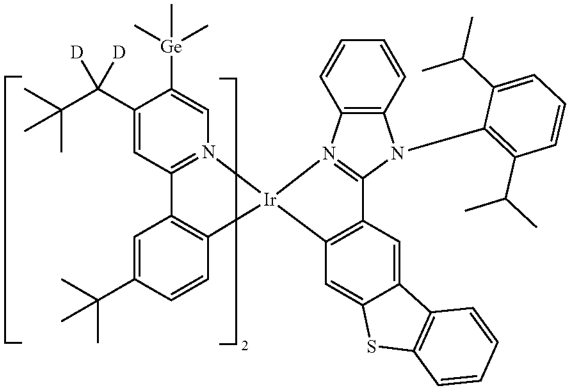
1248
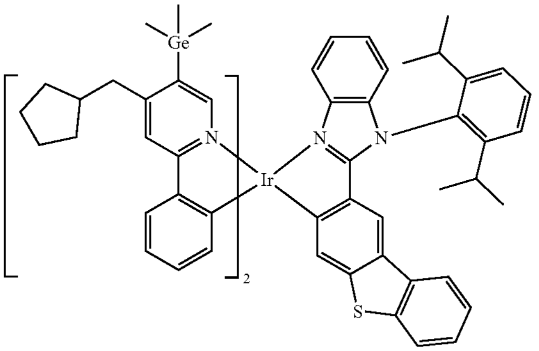
-continued
1249
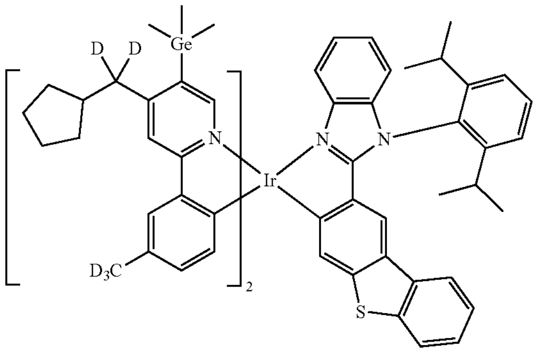
1250
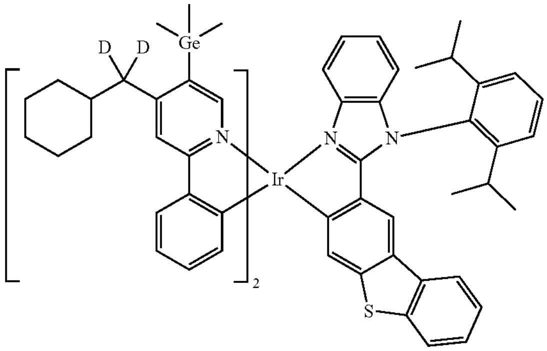
1251
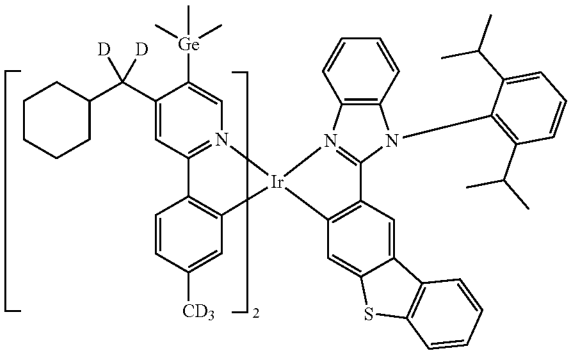
1252
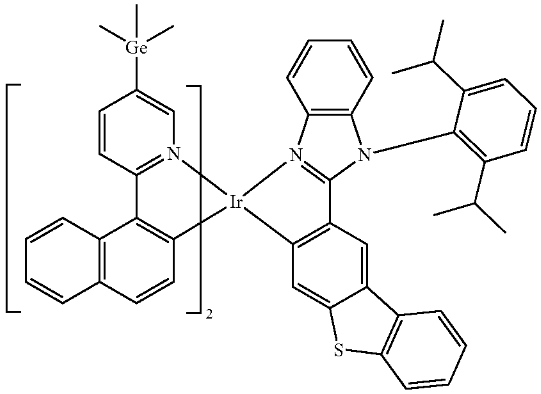

-continued
1253
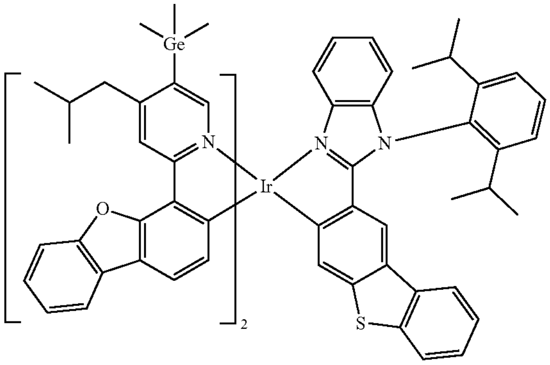
1254
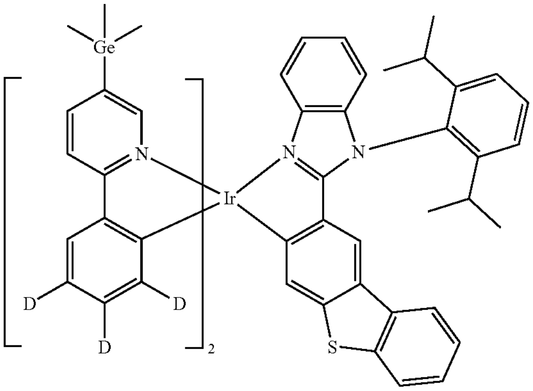
1255
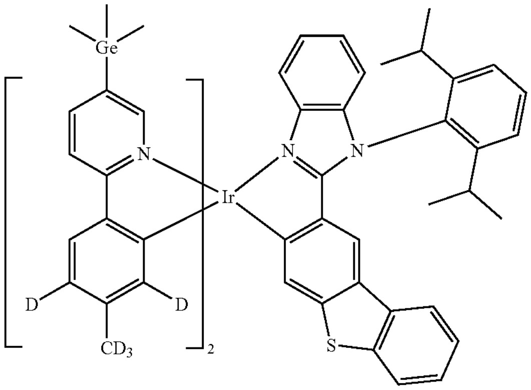
1256
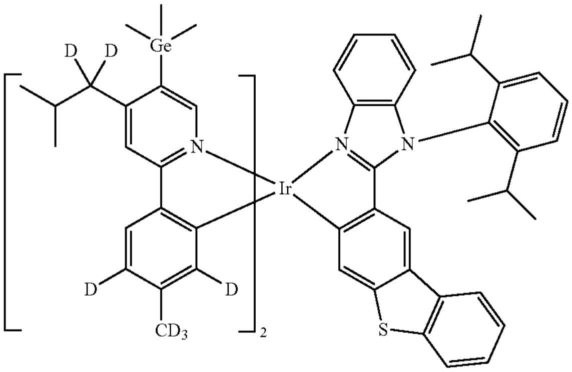
-continued
1257
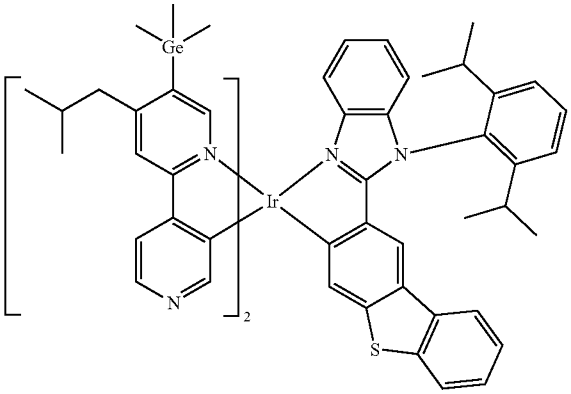
1258
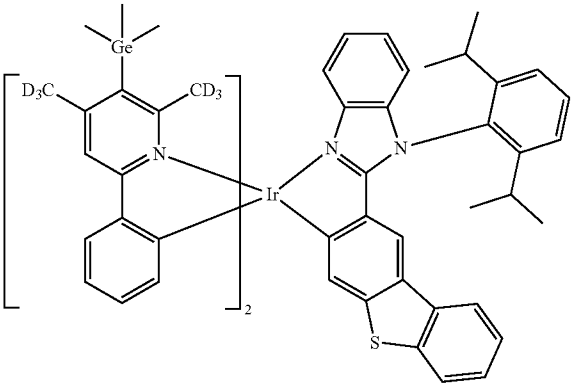
1259
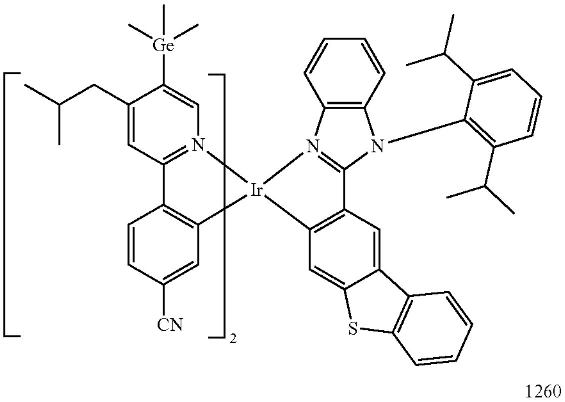
1260
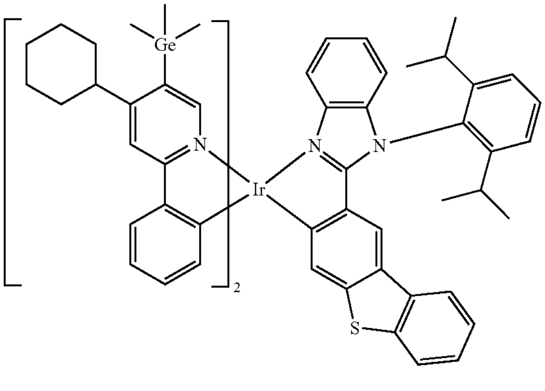

-continued
1261
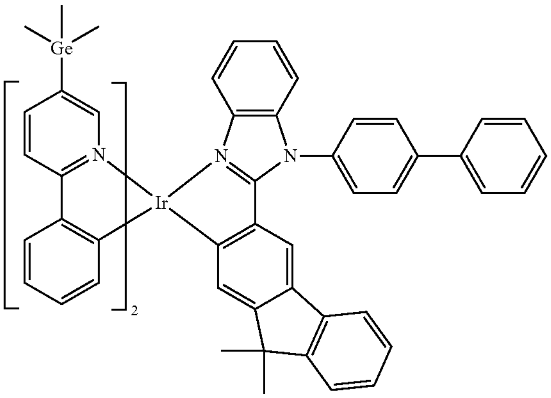
1262
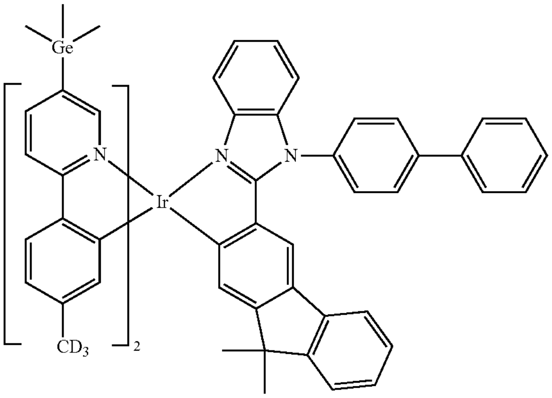
1263
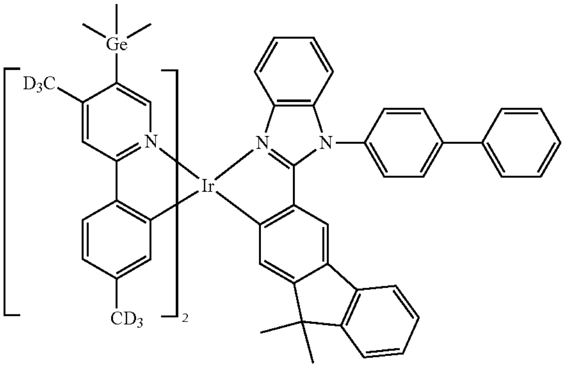
1264
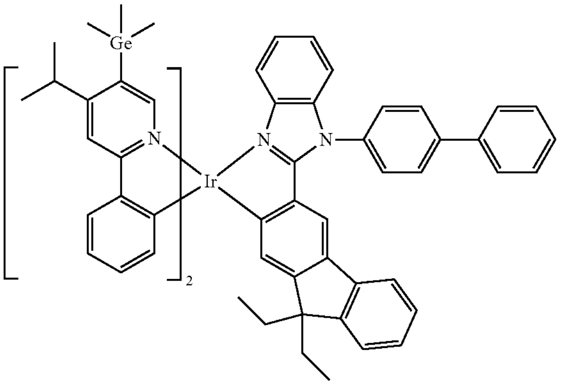
-continued
1265
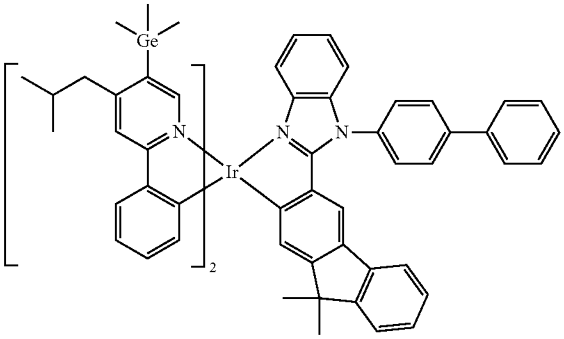
1266
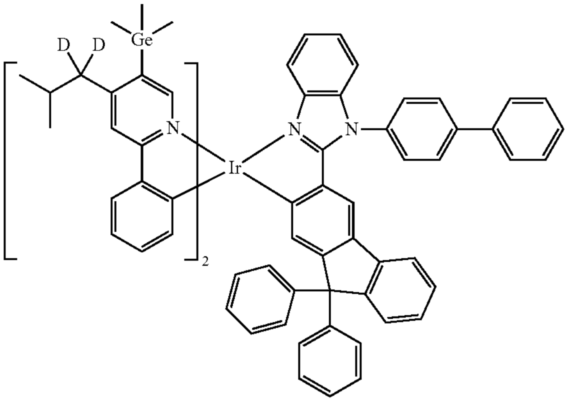
1267
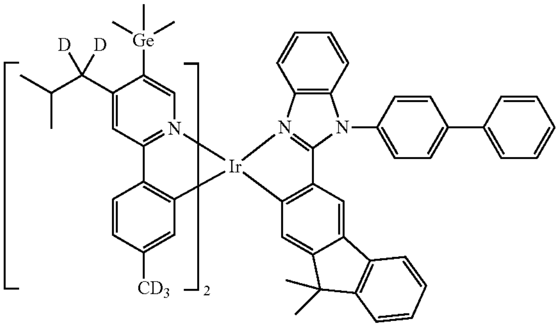
1268
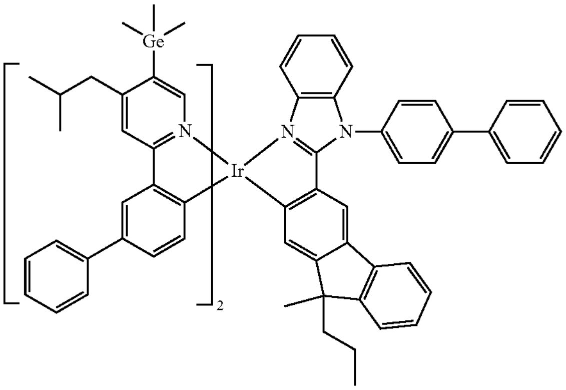

-continued
1269
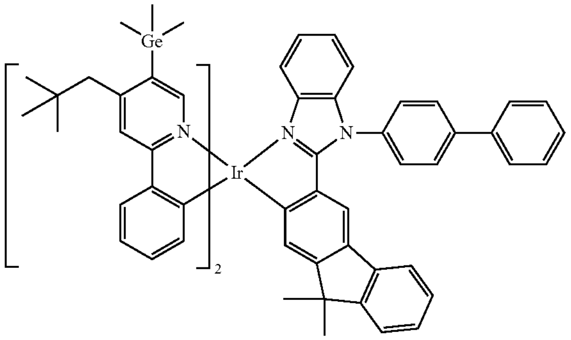
1270
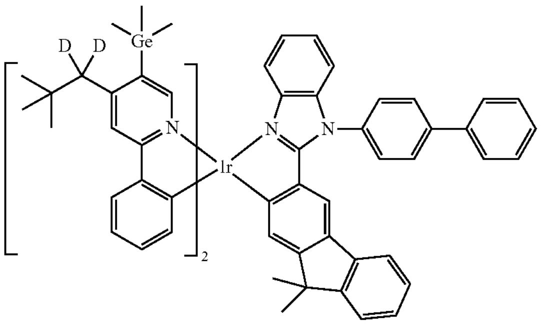
1271
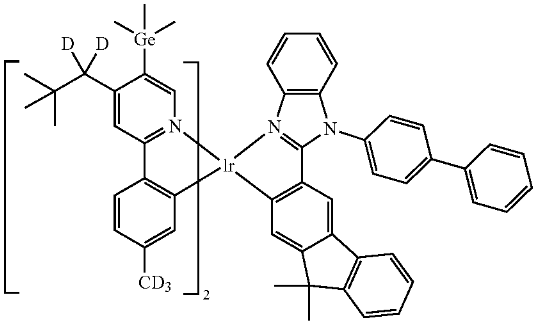
1272
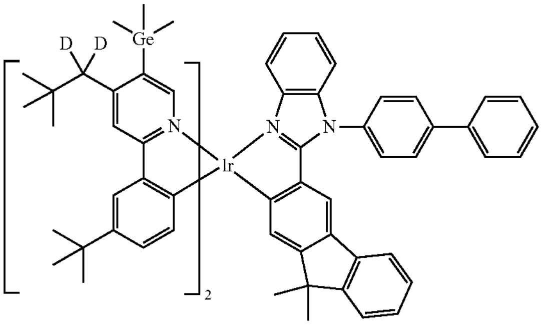
-continued
1273
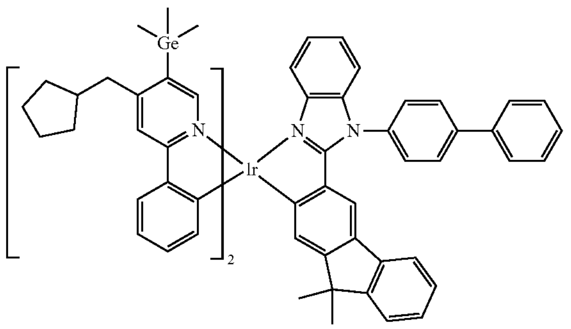
1274
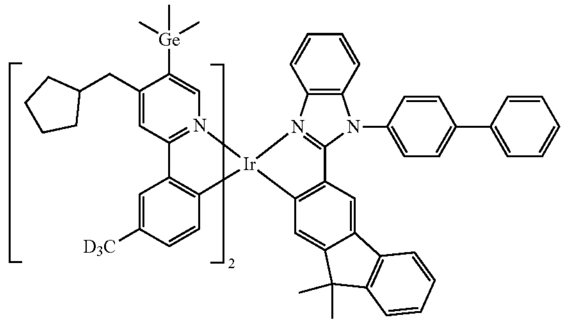
1275
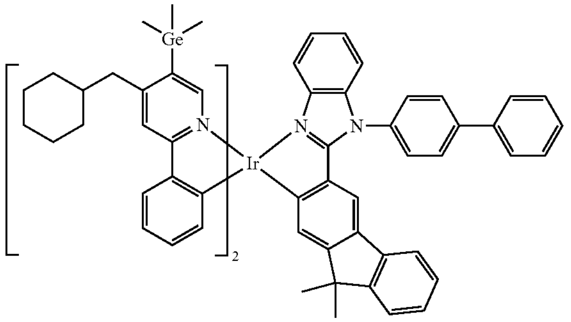
1276
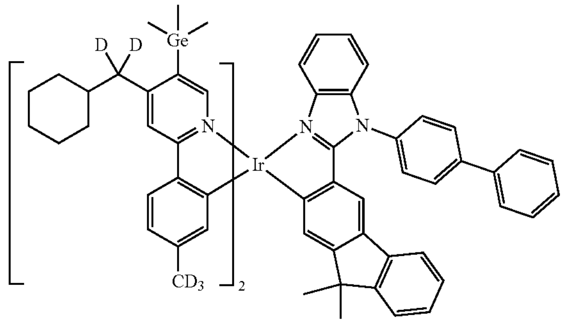

-continued
1277
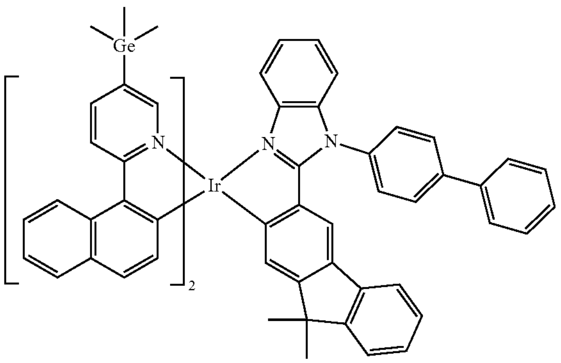
1278
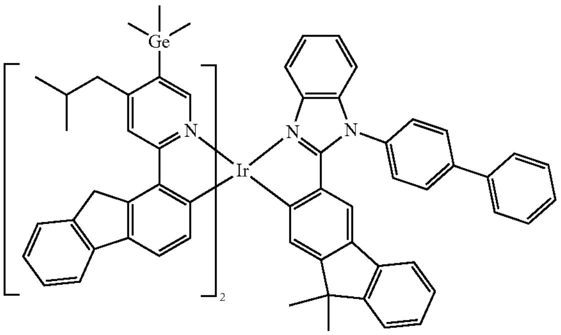
1279
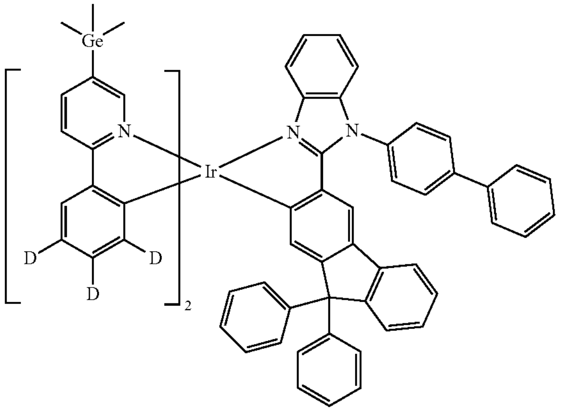
1280
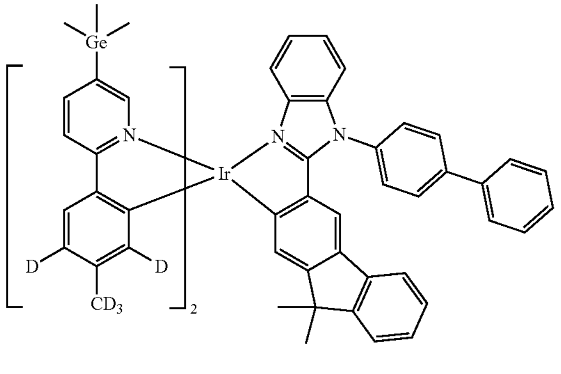
-continued
1281
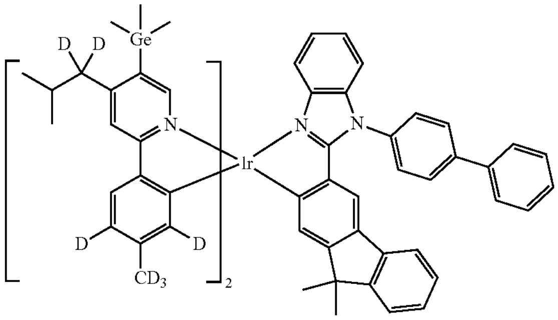
1282
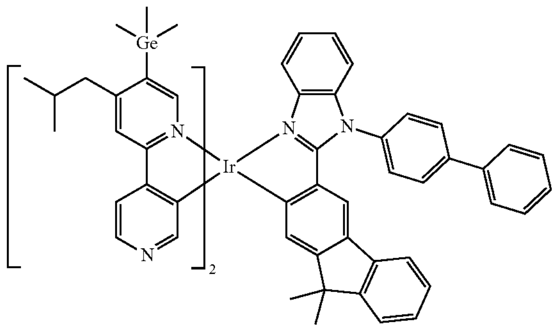
1283
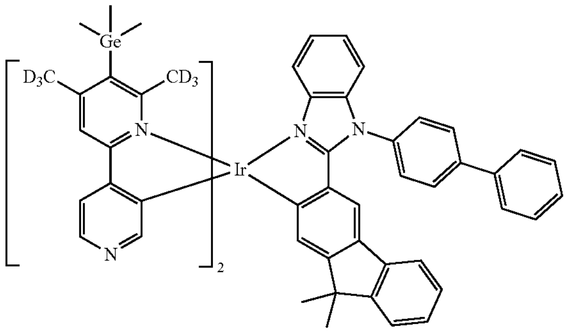
1284
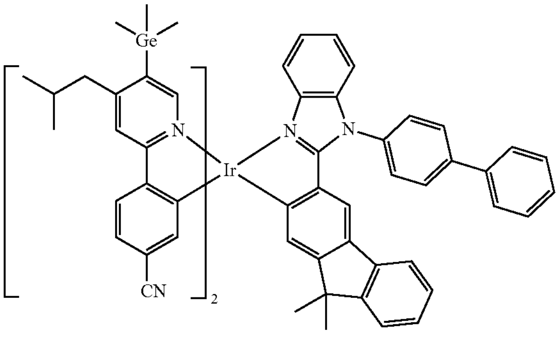

-continued
1285
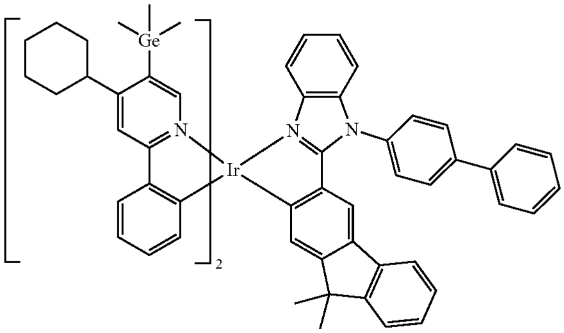
1286
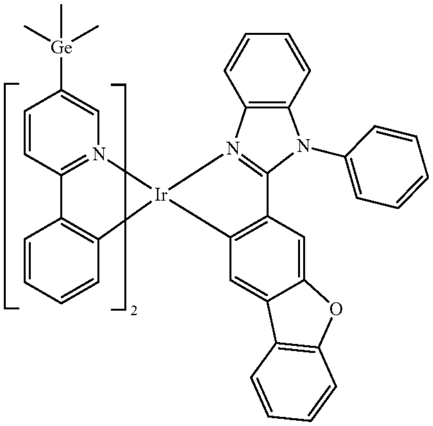
1287
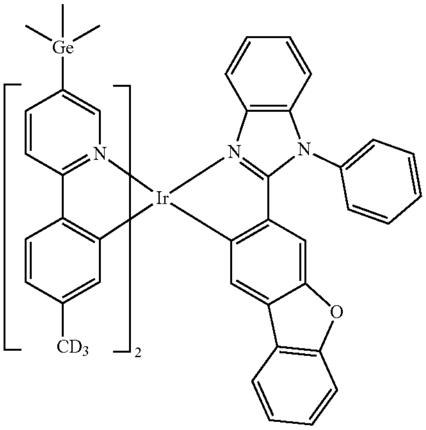
1288
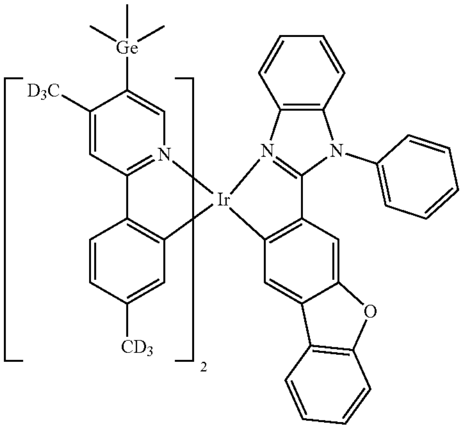
1289
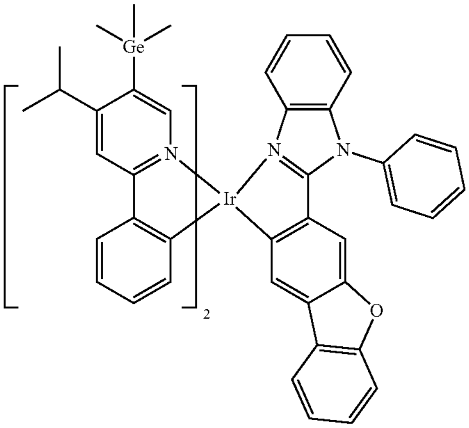
1290
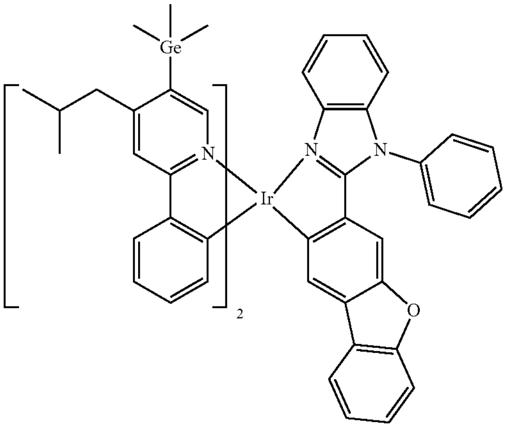

-continued
1291
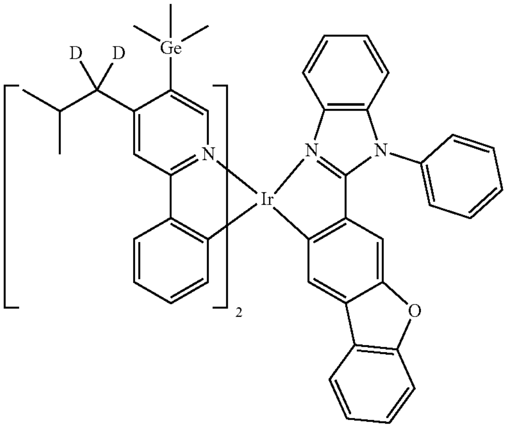
1292
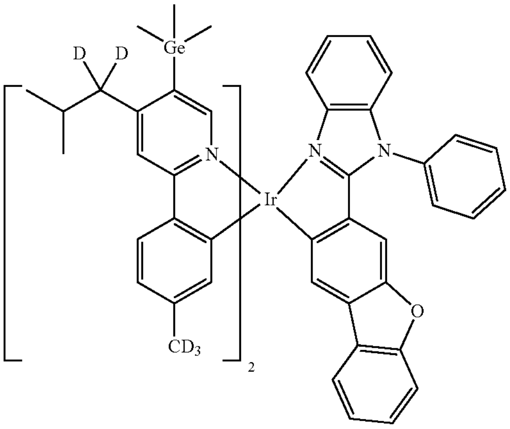
1293
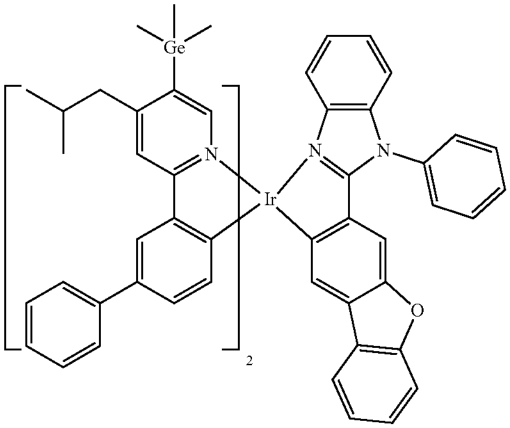
-continued
1294
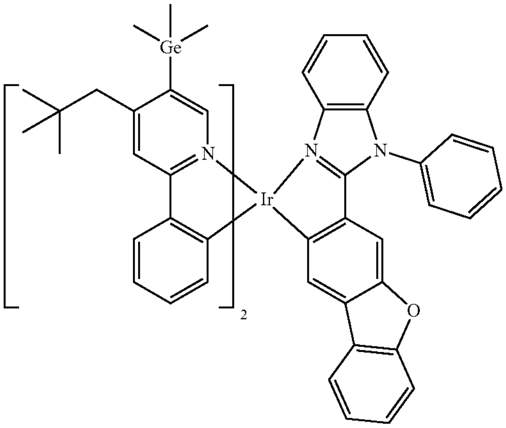
1295
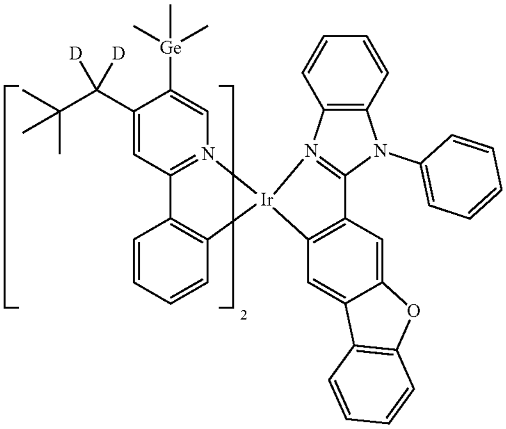
1296
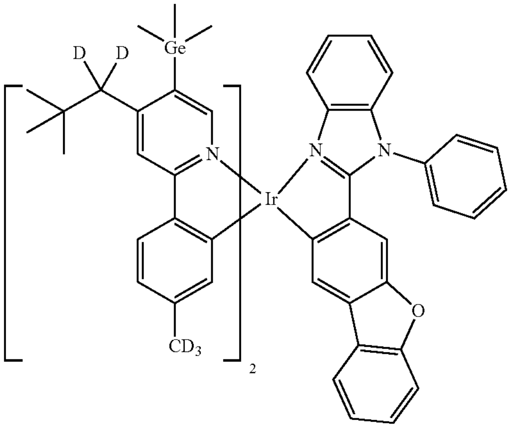

-continued
1297
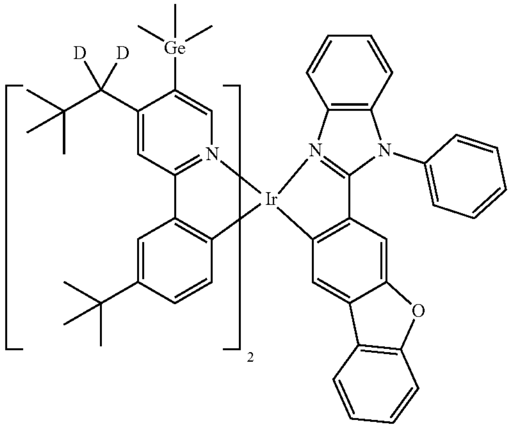
1298
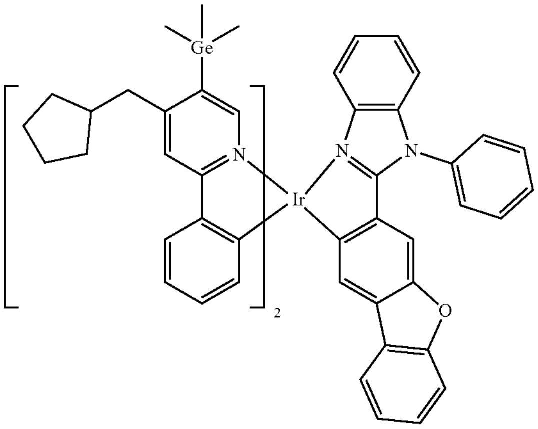
1299
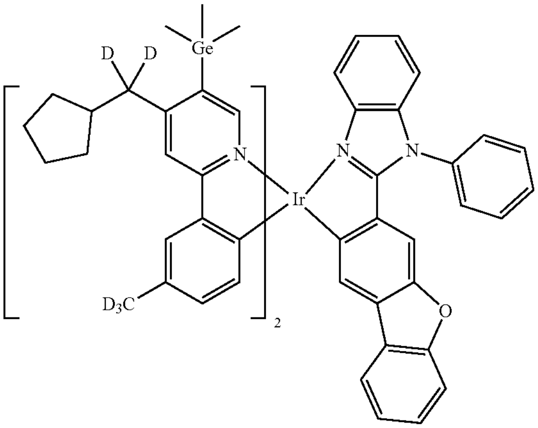
-continued
1300
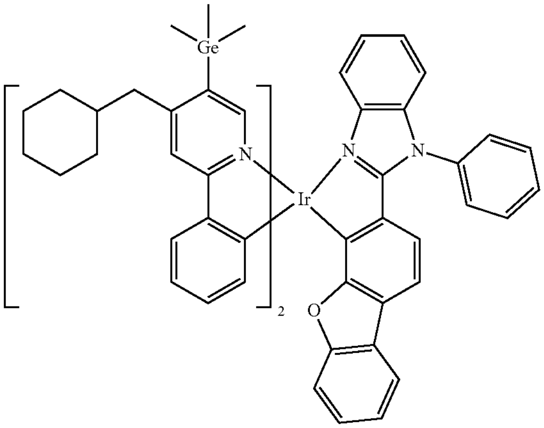
1301
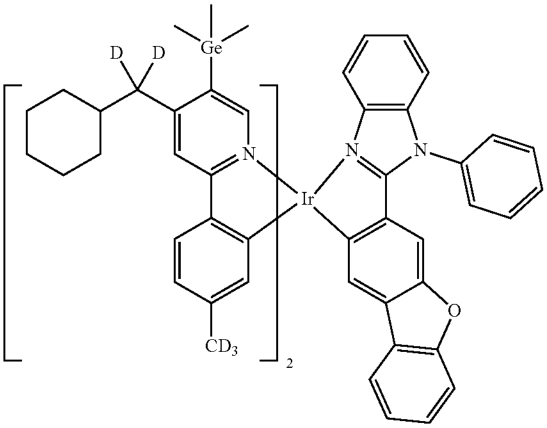
1302
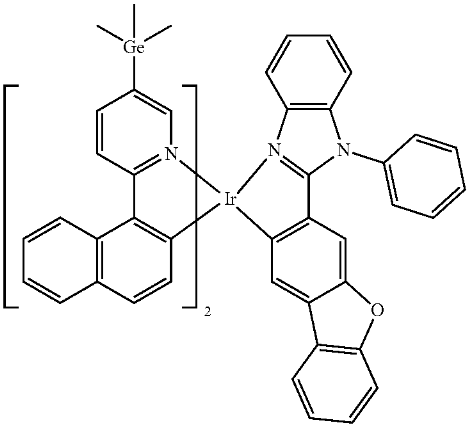

-continued
1303
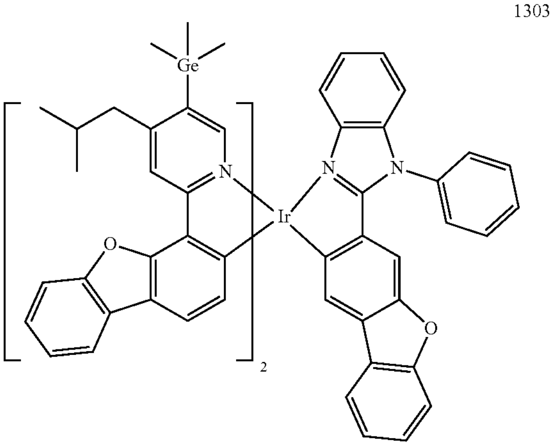
1304
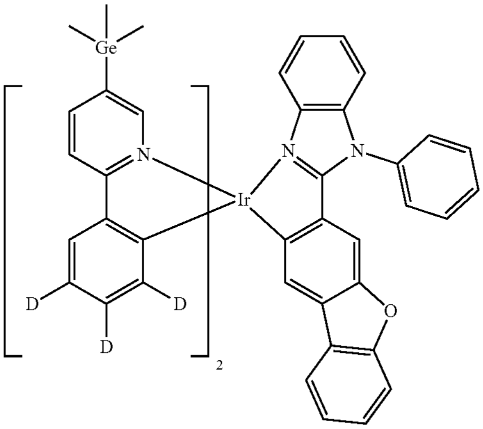
1305
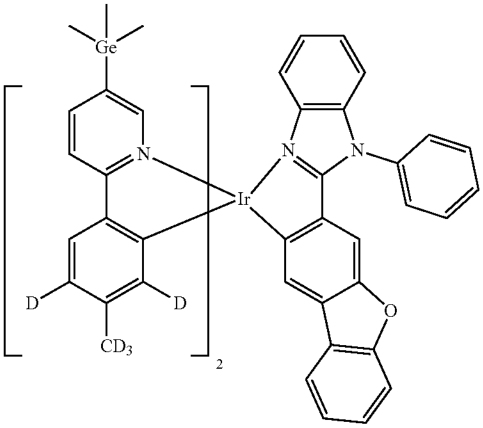
1306
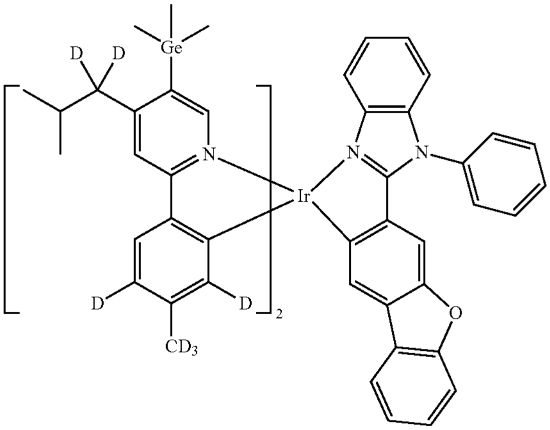
1307
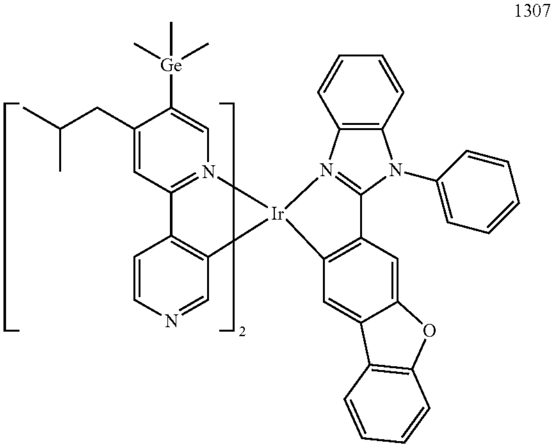
1308
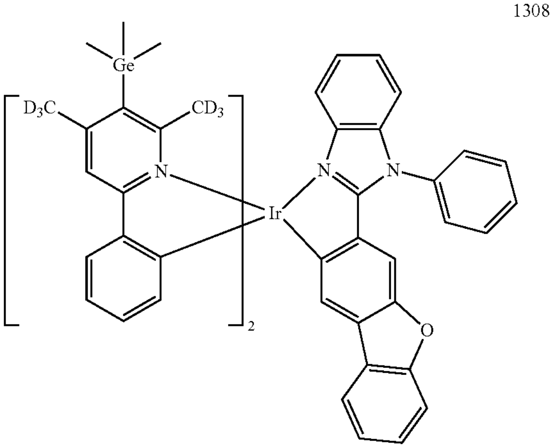

-continued
1309
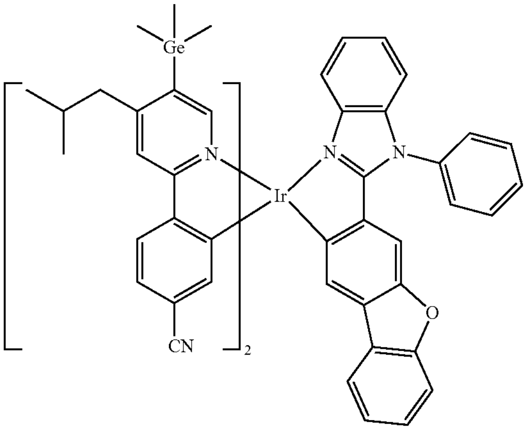
1310
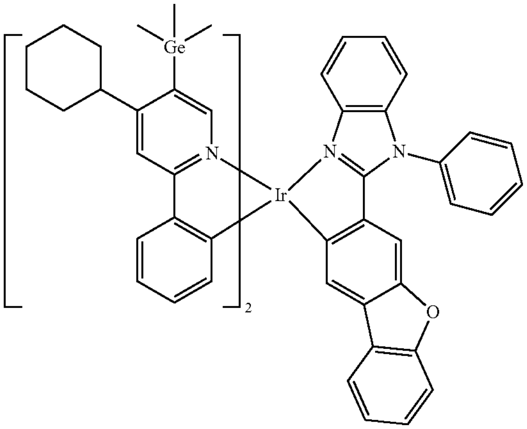
1311
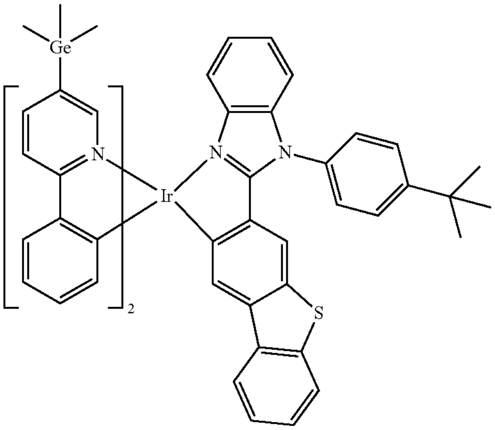
-continued
1312
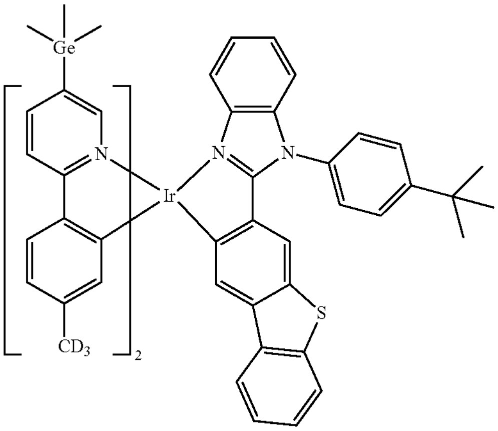
1313
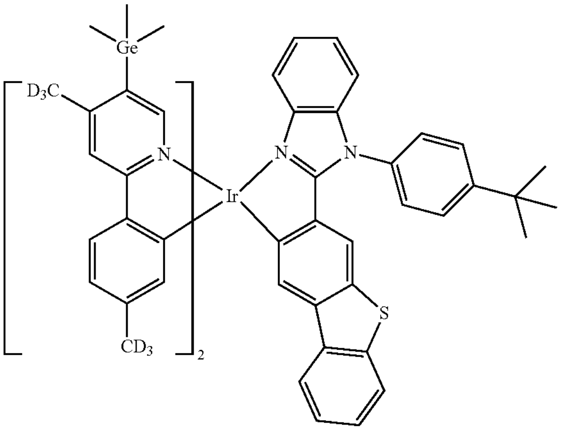
1314
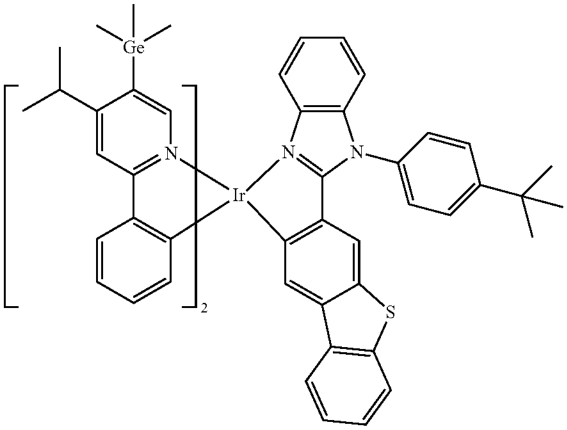

-continued
1315
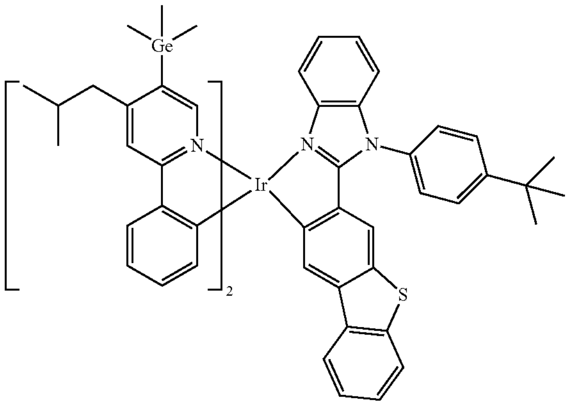
1316
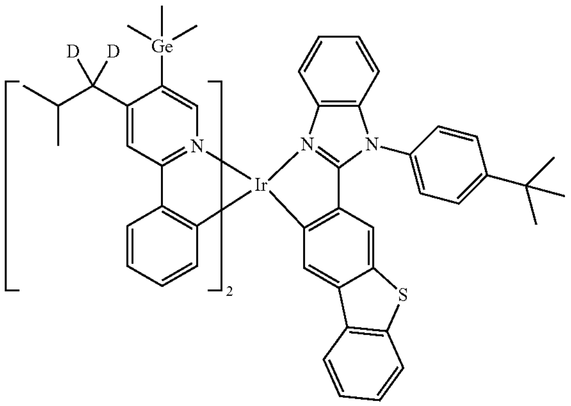
1317
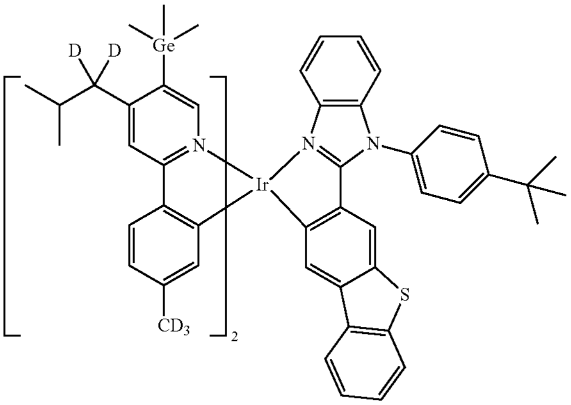
-continued
1318
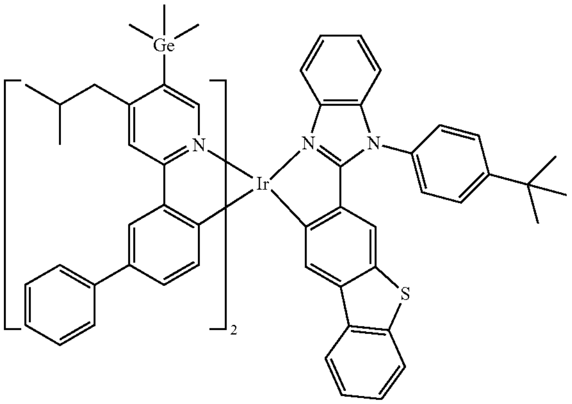
1319
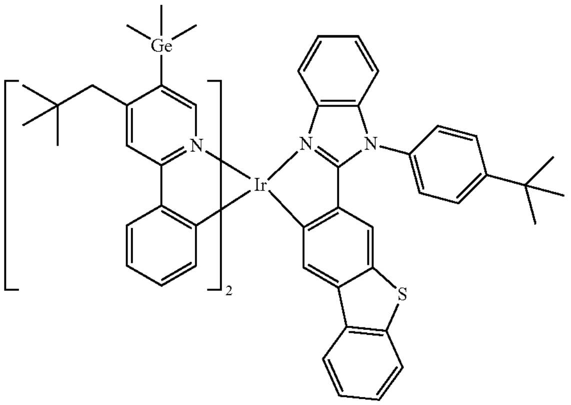
1320
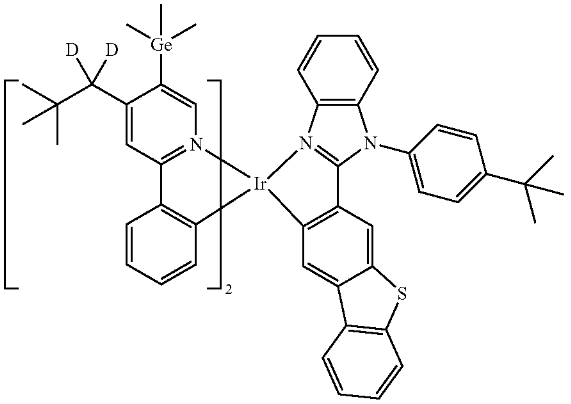

-continued
1321
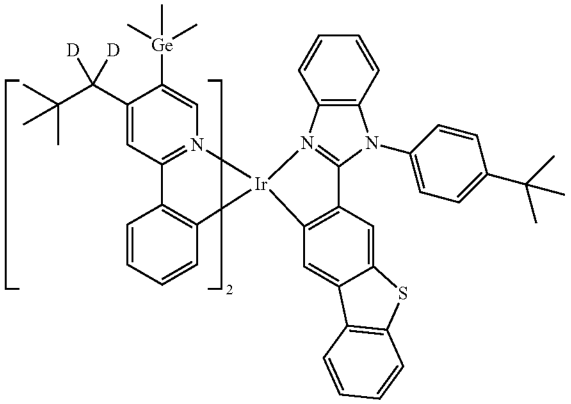
1322
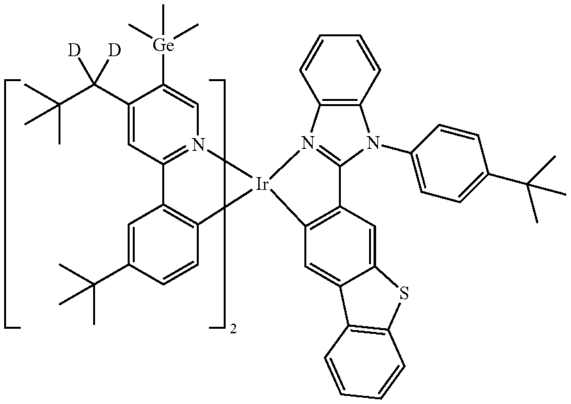
1323
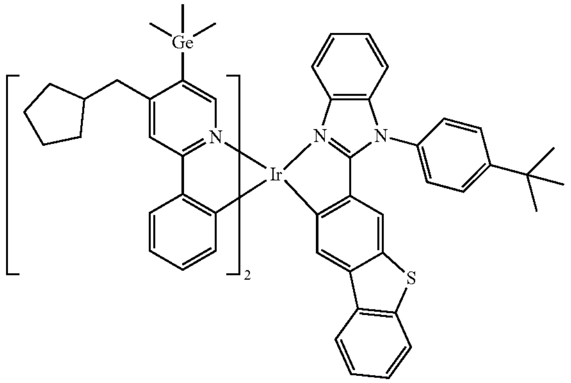
-continued
1324
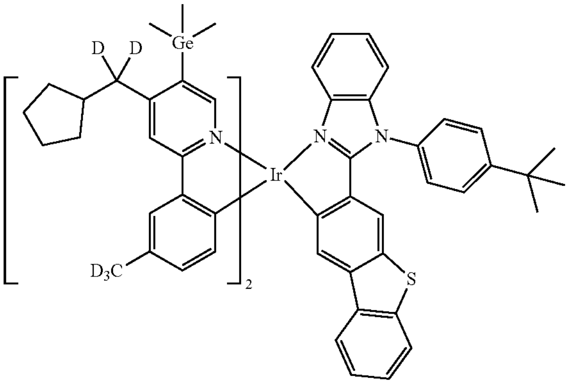
1325
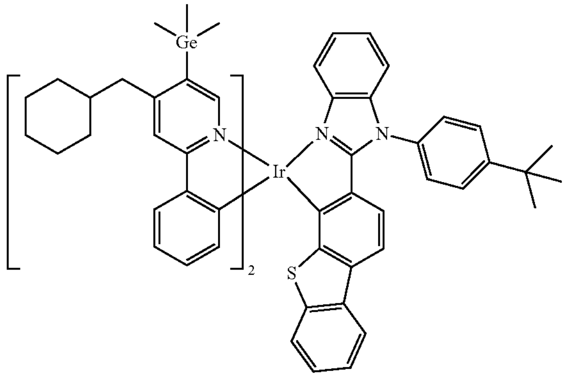
1326
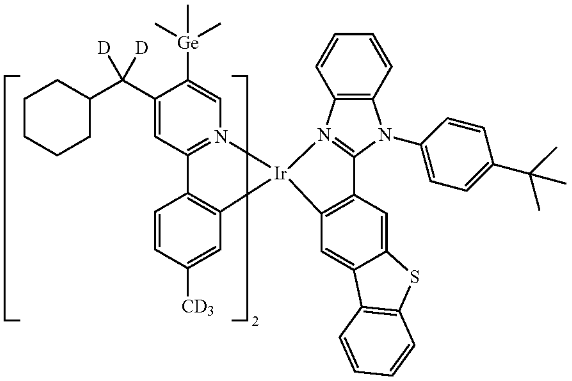
1327
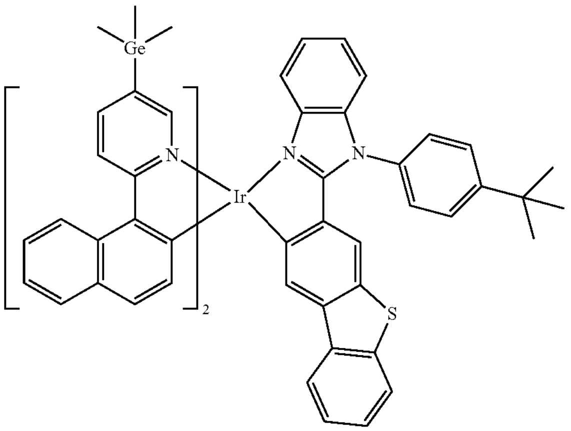

-continued
1328
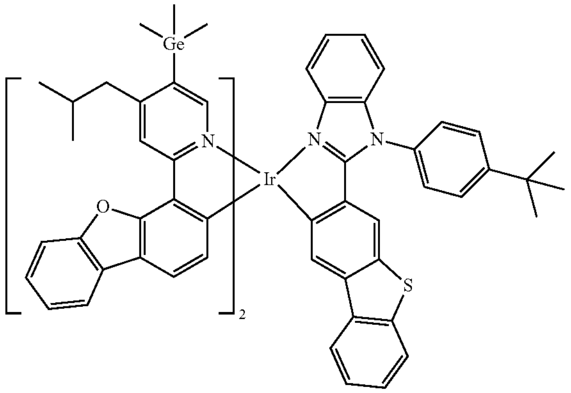
1329
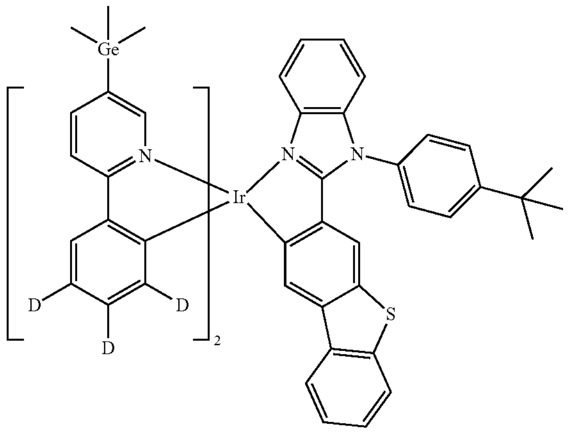
1330
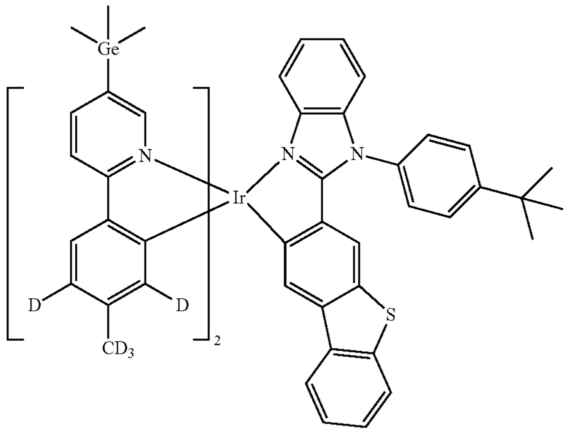
-continued
1331
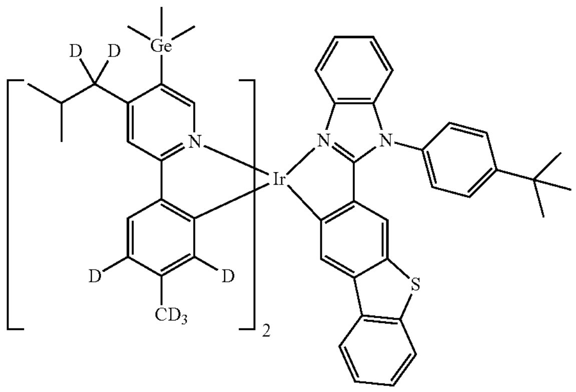
1332
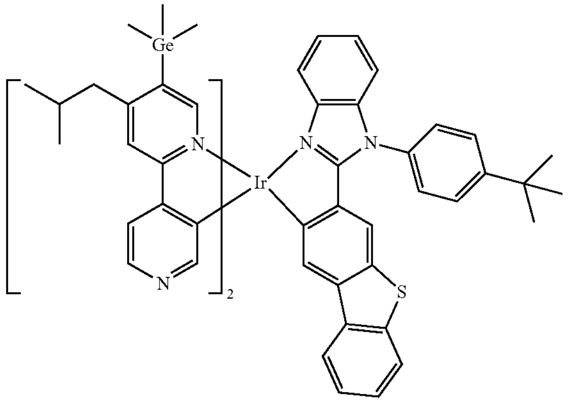
1333
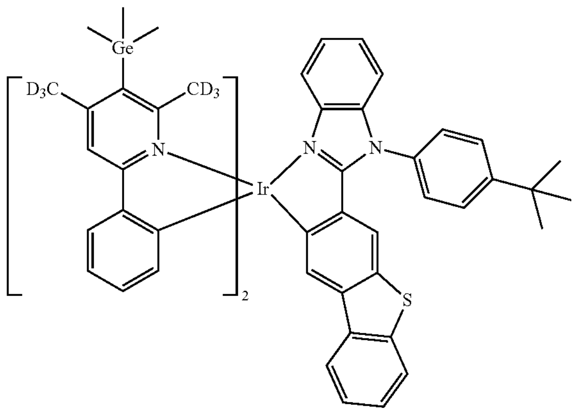

1334
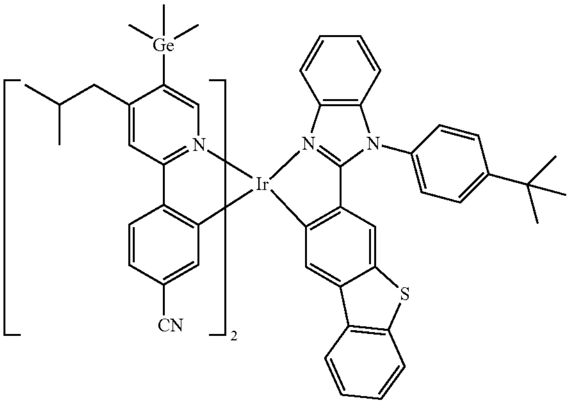
1335
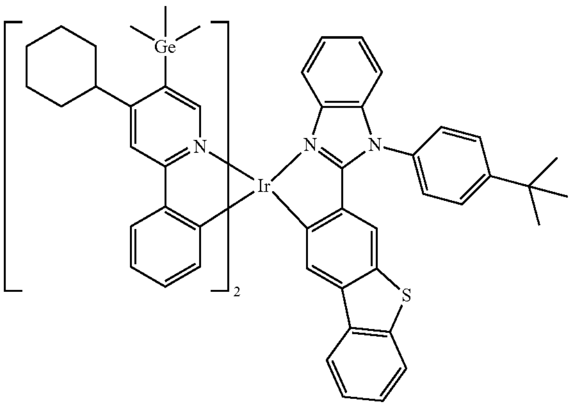
1336
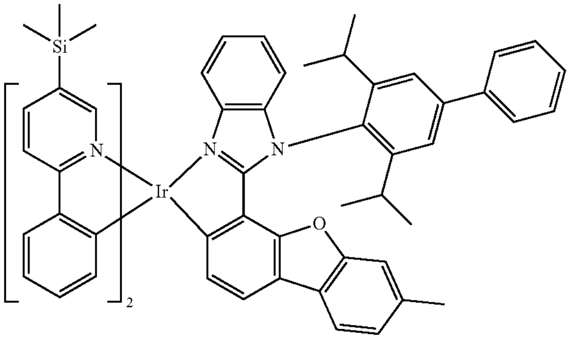
1337
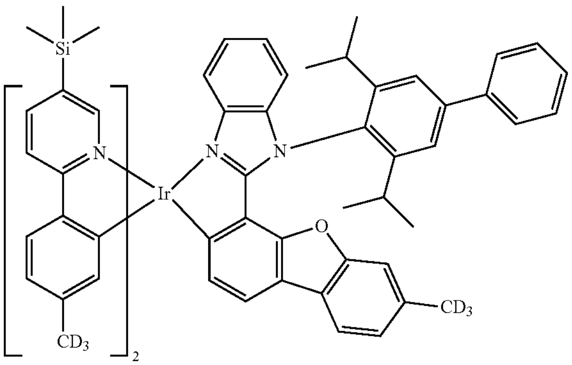
1338
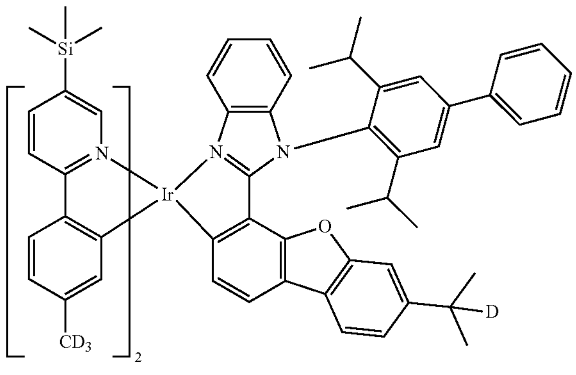
1339
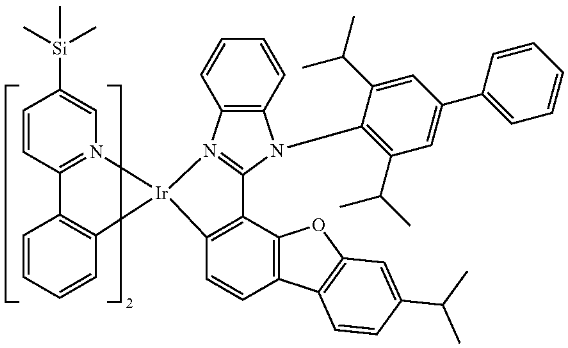
1340
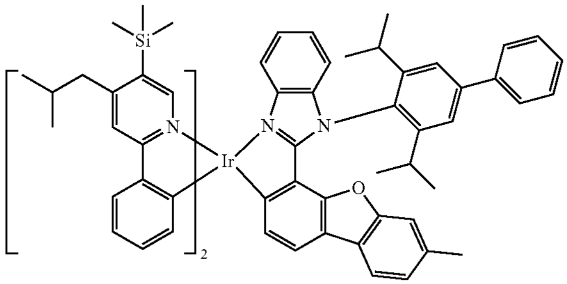
1341
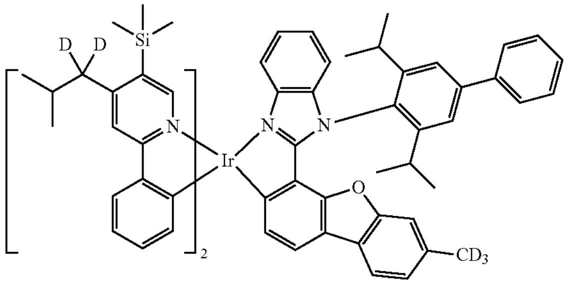

-continued
1342
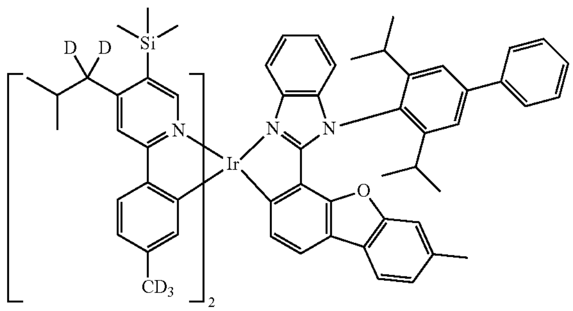
1343
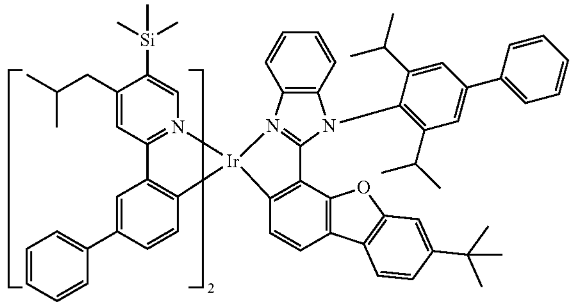
1344
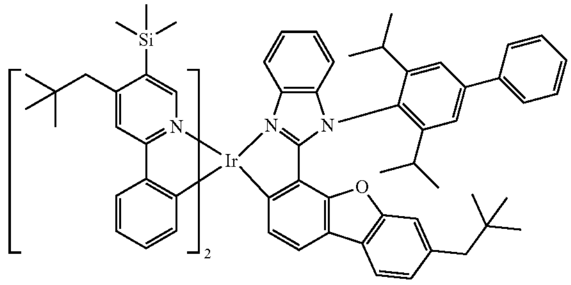
1345
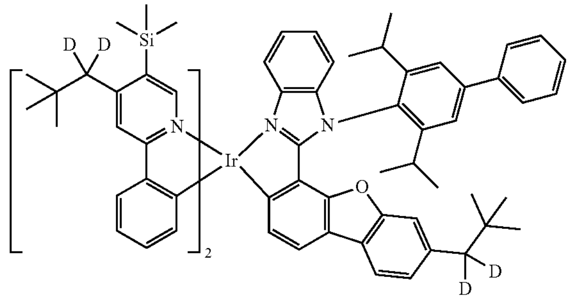
1346
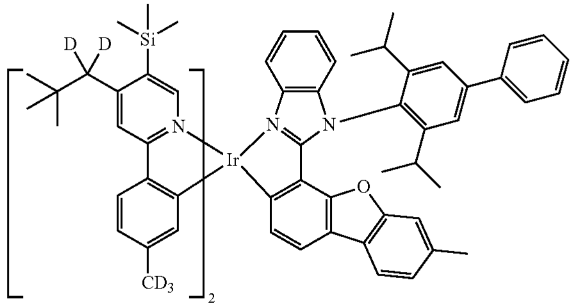
-continued
1347
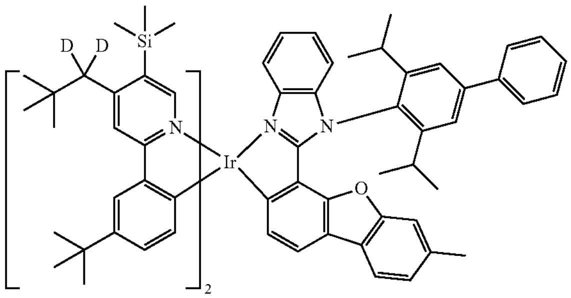
1348
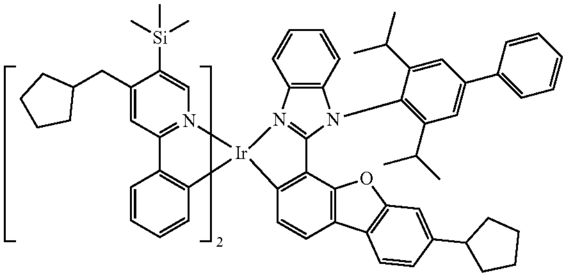
1349
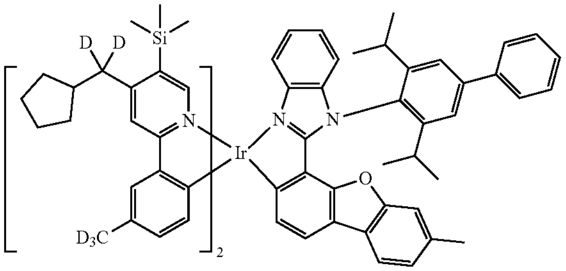
1350
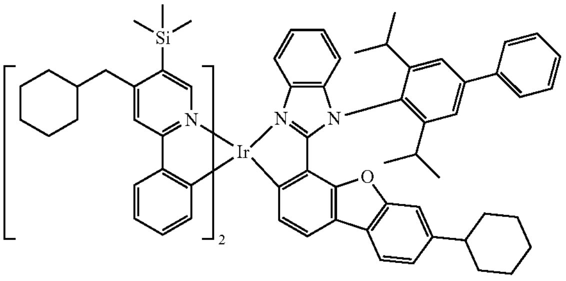
1351
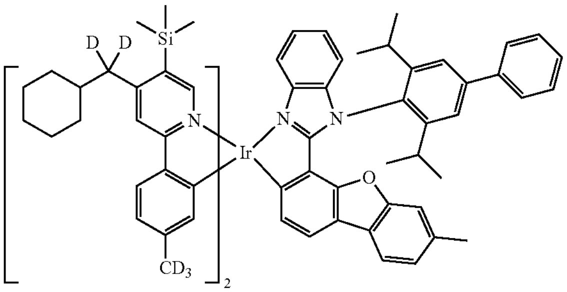

-continued
1352
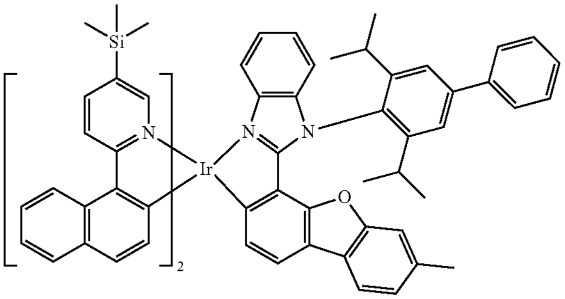
1353
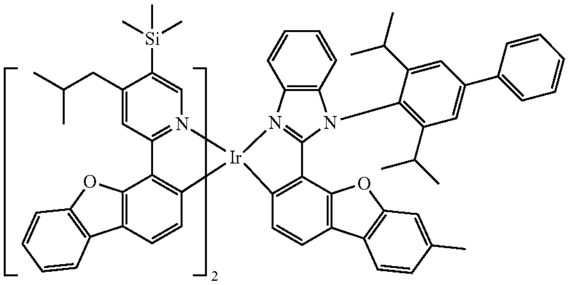
1354
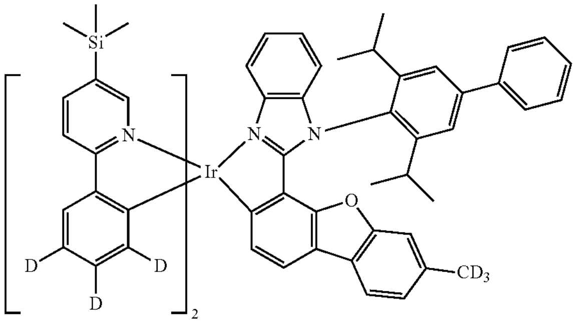
1355
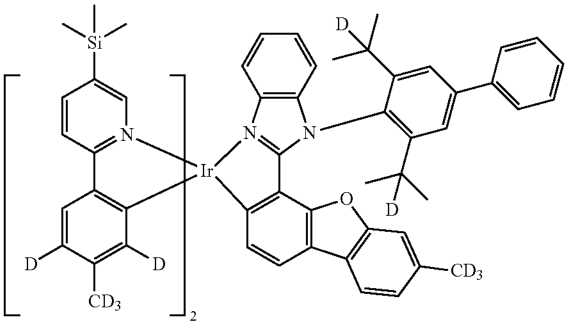
1356
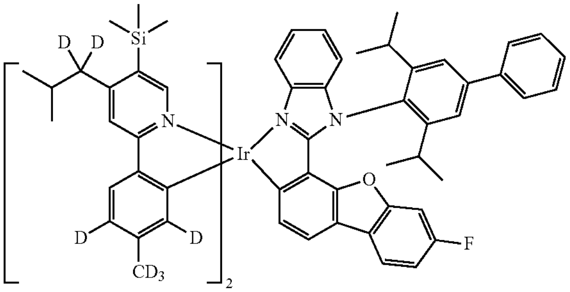
-continued
1357
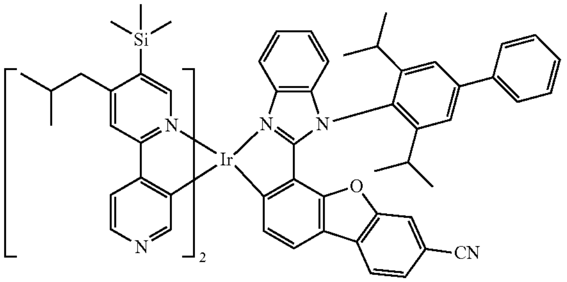
1358
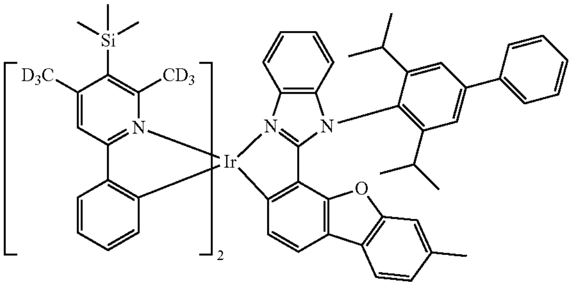
1359
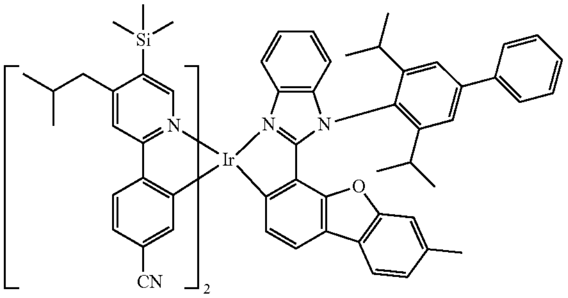
1360
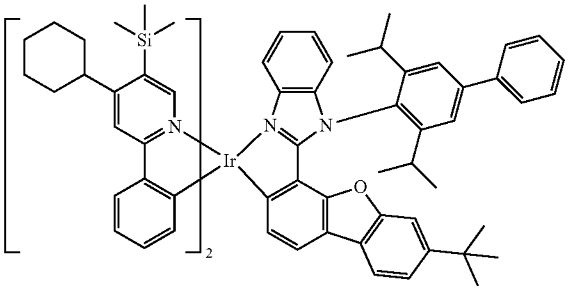
1361
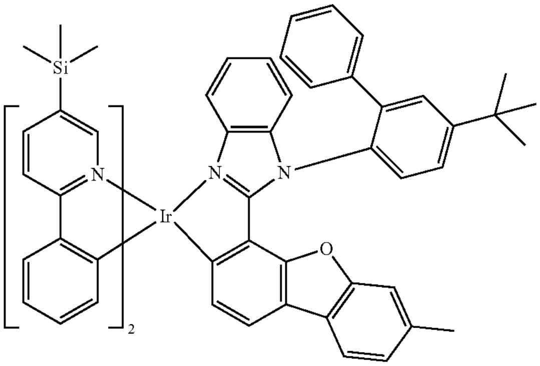

-continued
1362
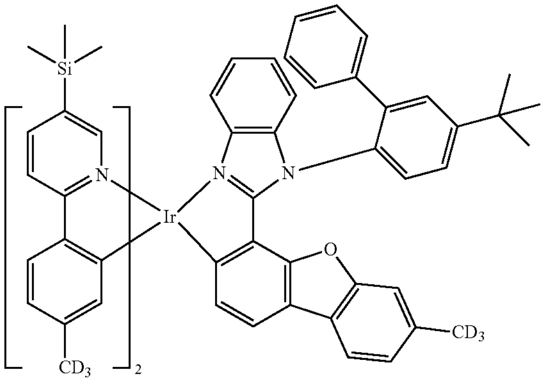
1363
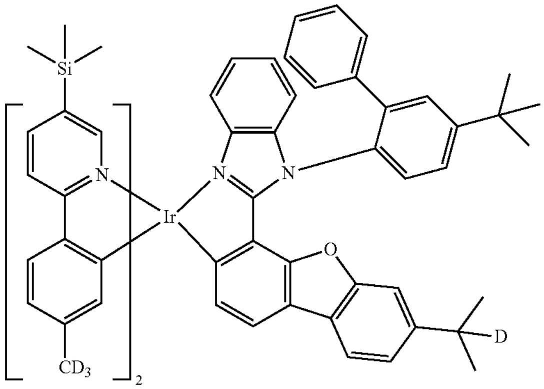
1364
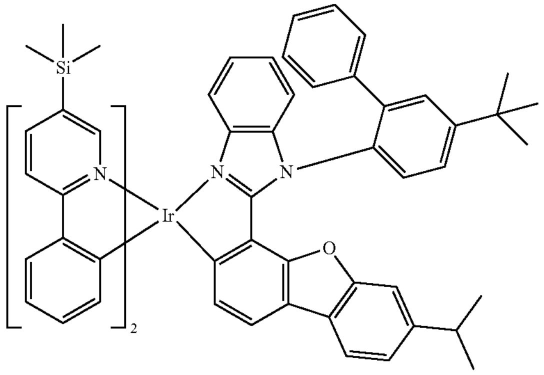
1365
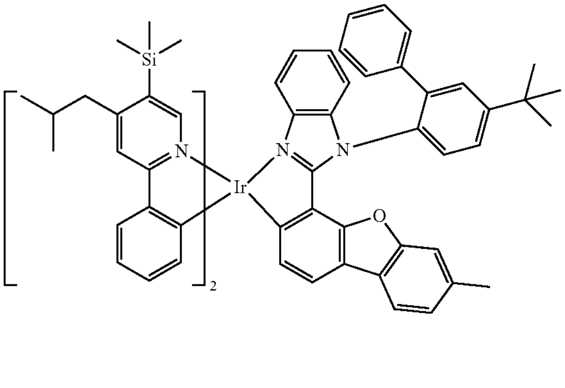
-continued
1366
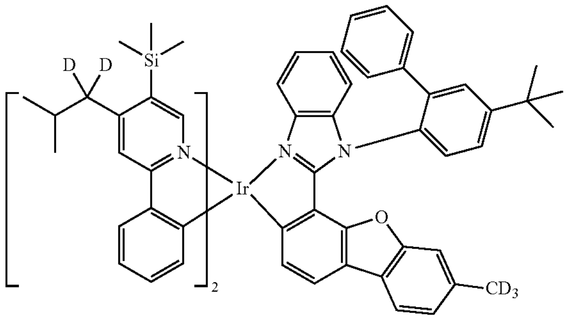
1367
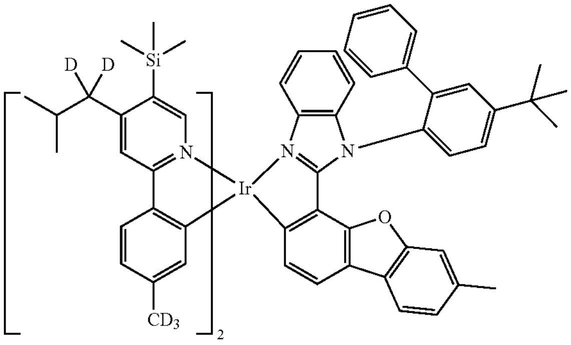
1368
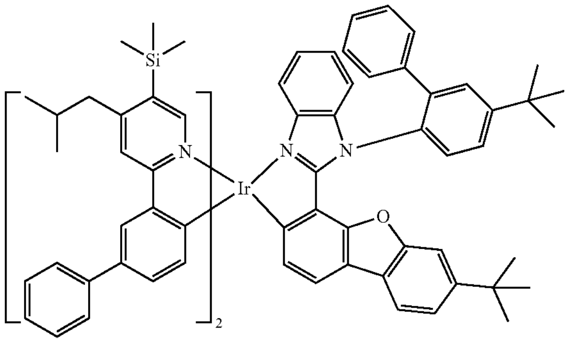
1369
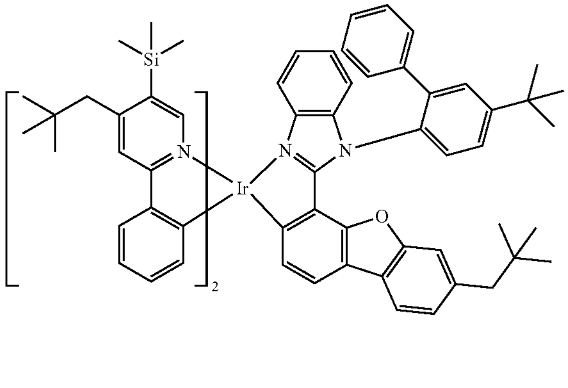

-continued
1370
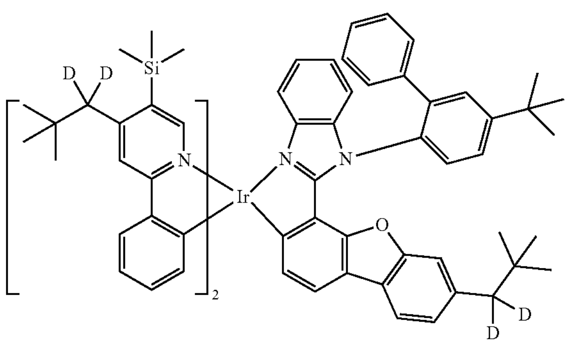
1371
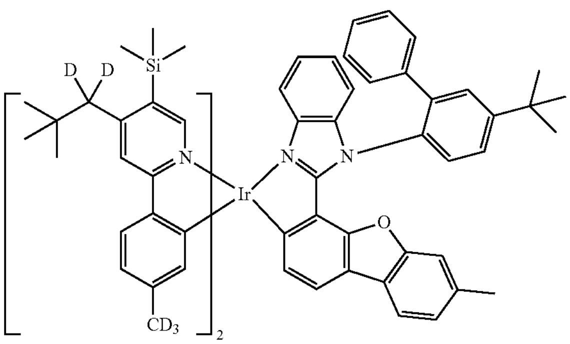
1372
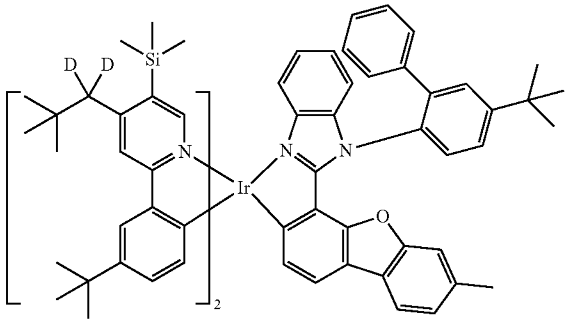
1373
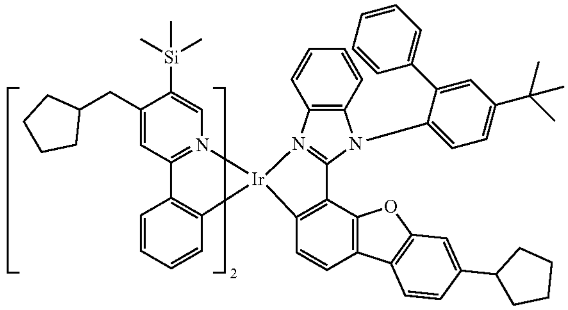
-continued
1374
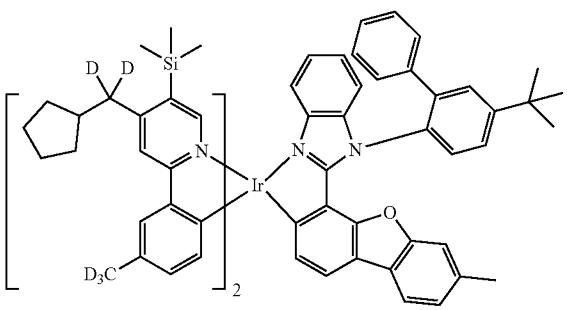
1375
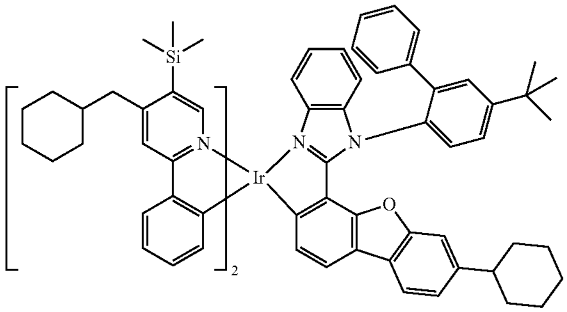
1376
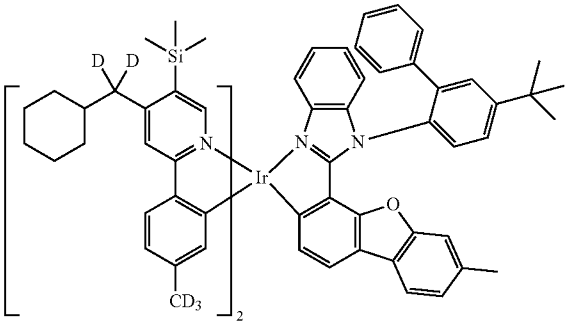
1377
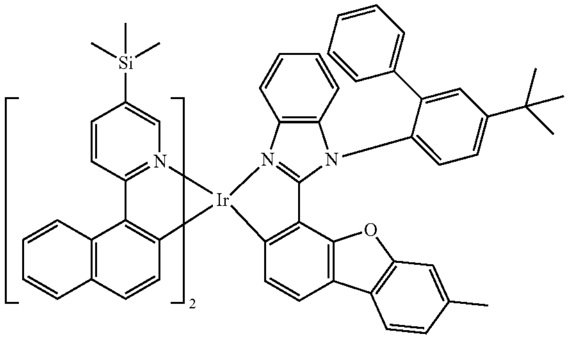

-continued
1378
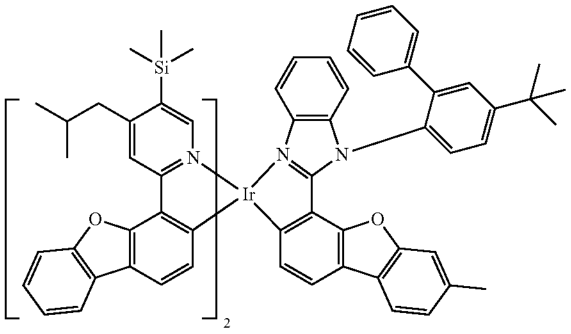
1379
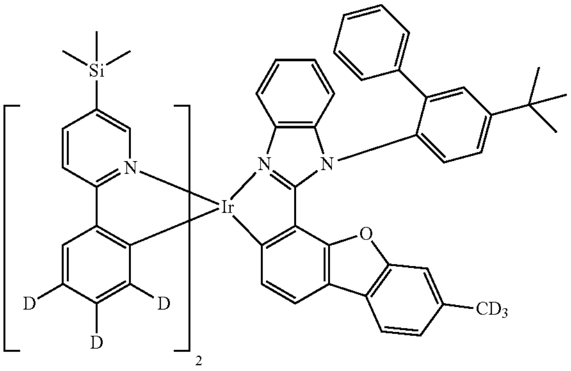
1380
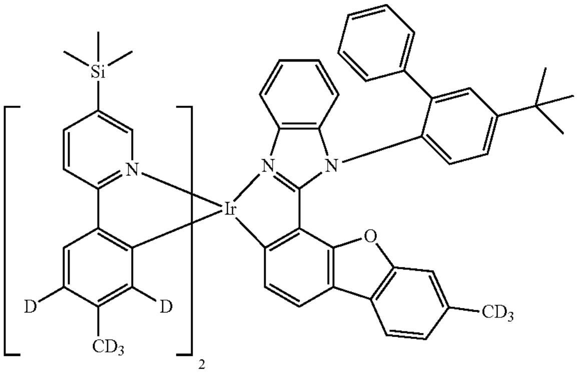
1381
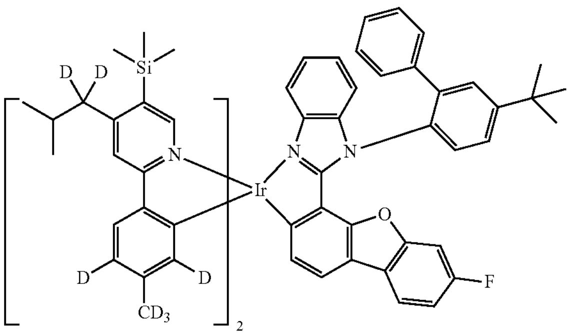
1382
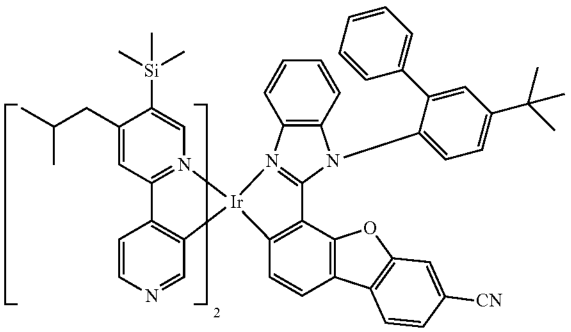
1383
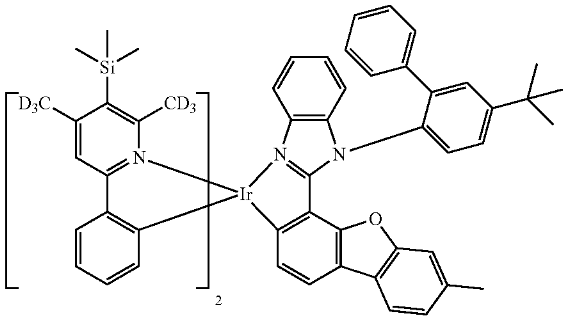
1384
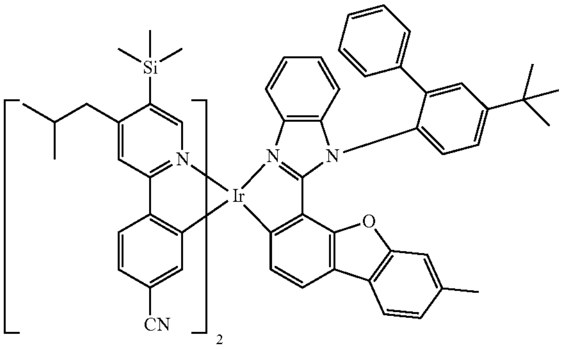
1385
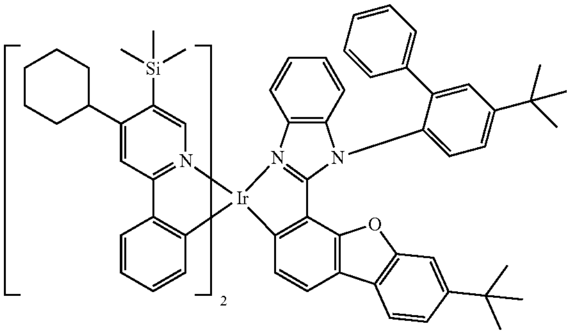

-continued
1386
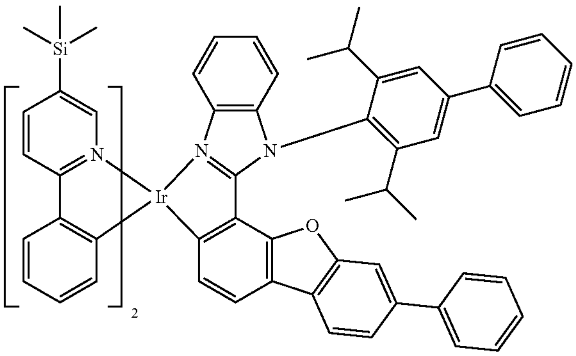
1387
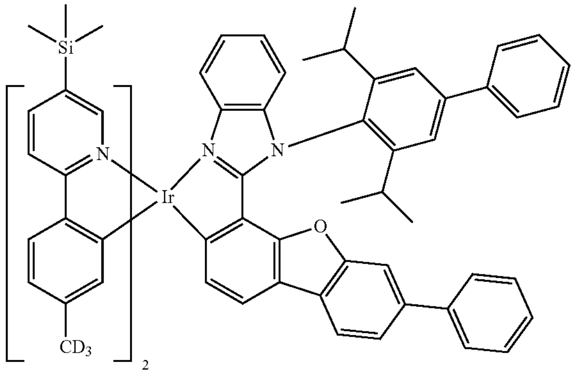
1388
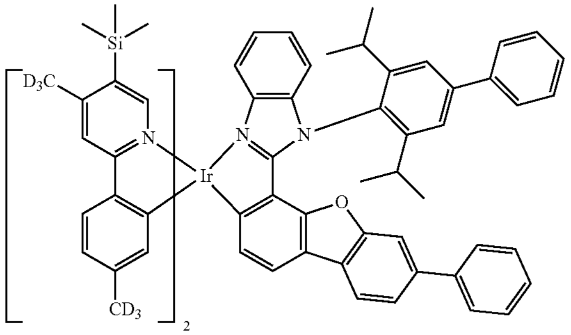
1389
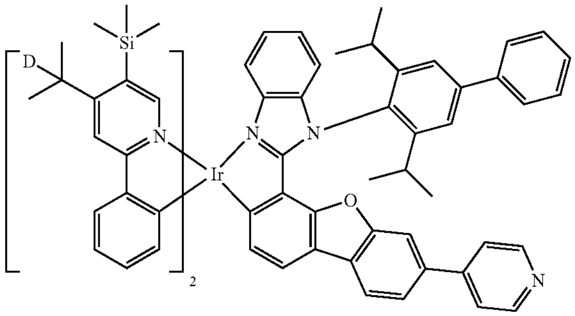
-continued
1390
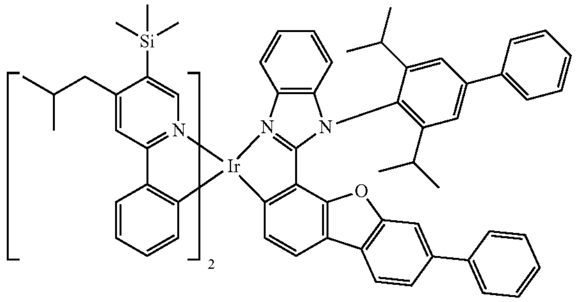
1391
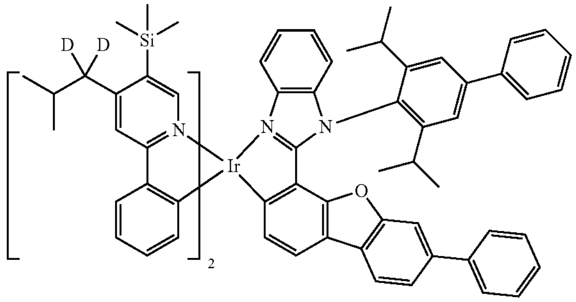
1392
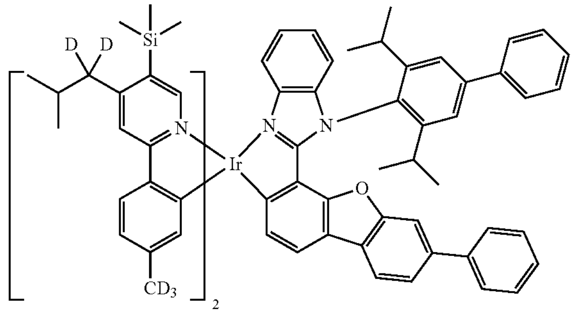
1393
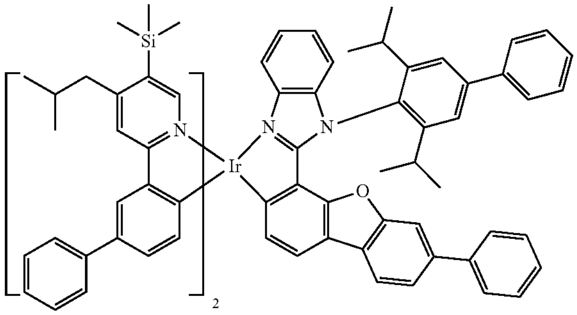

-continued
1394
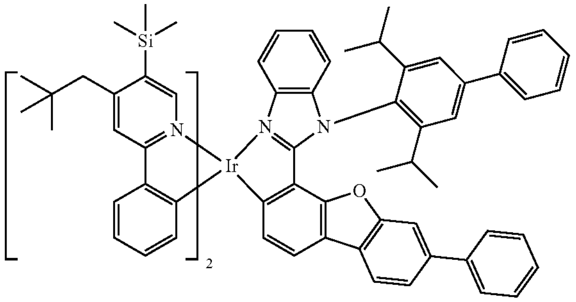
1395
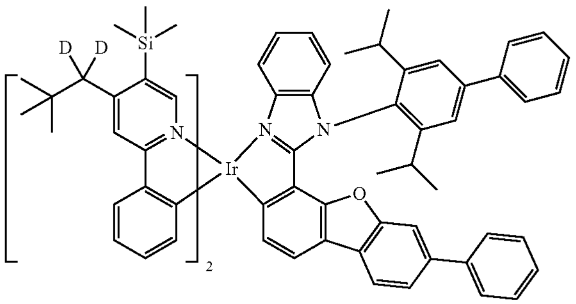
1396
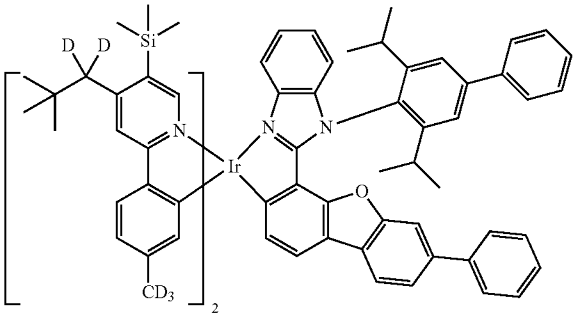
1397
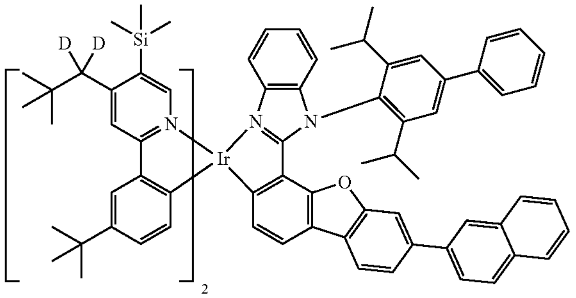
1398
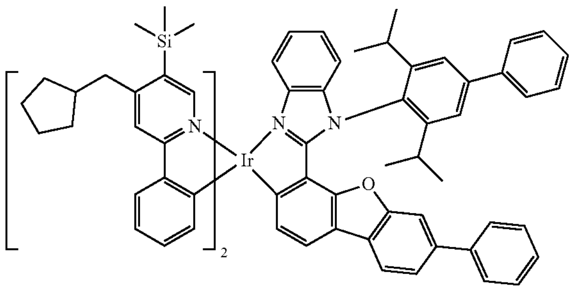
-continued
1399
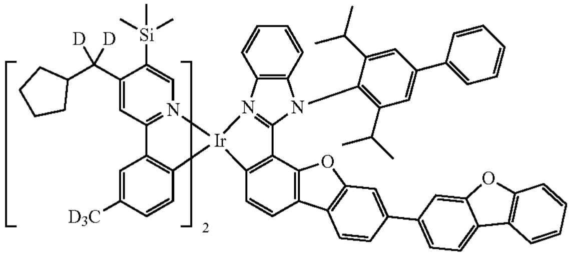
1400
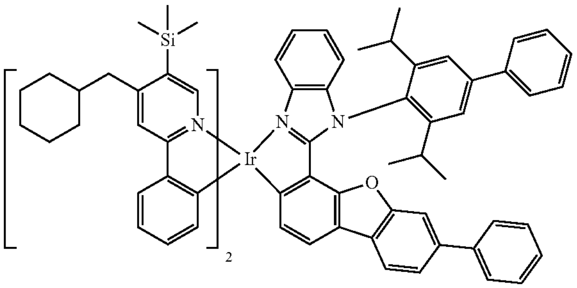
1401
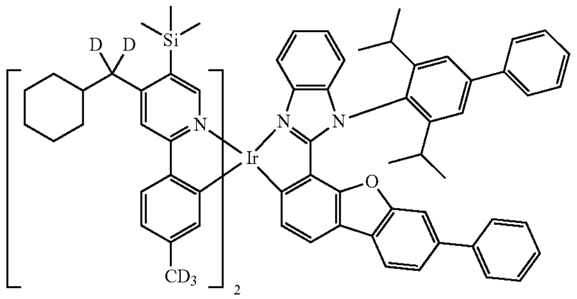
1402
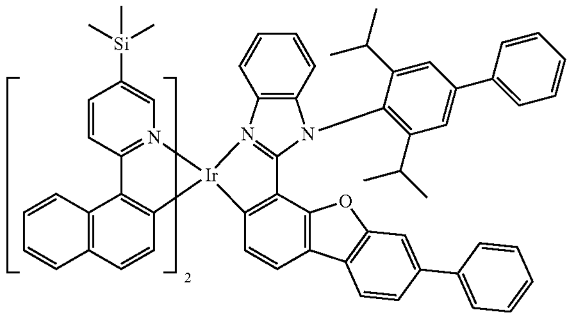
1403
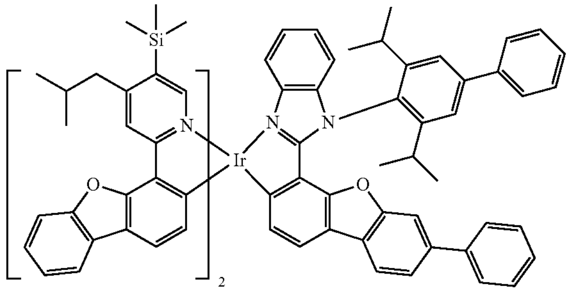

-continued
1404
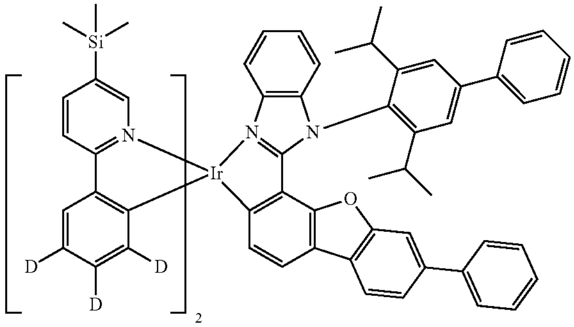
1405
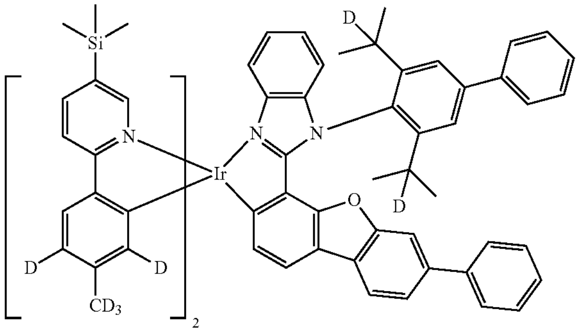
1406
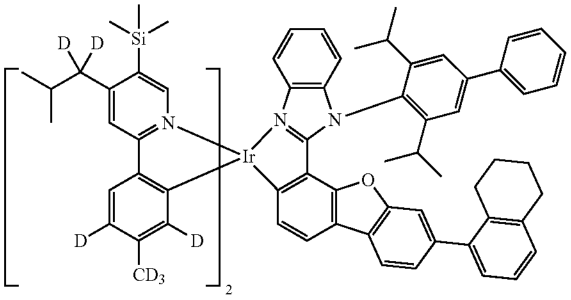
1407
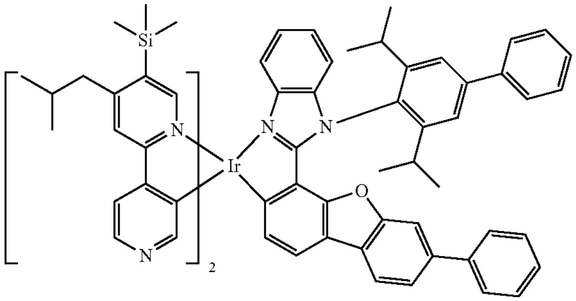
-continued
1408
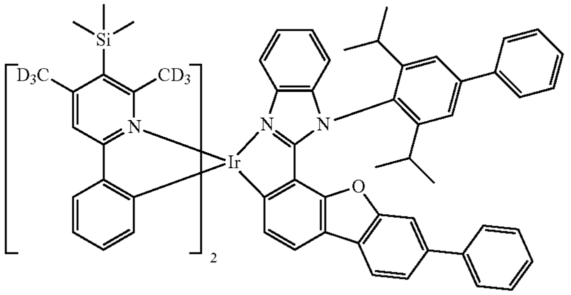
1409
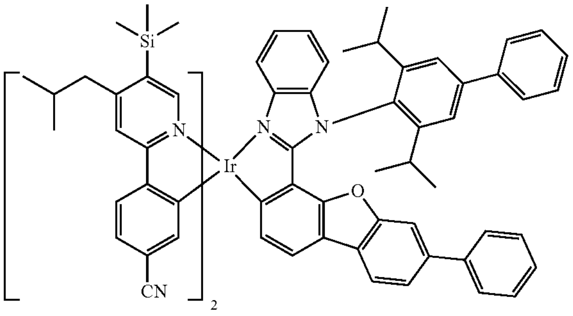
1410
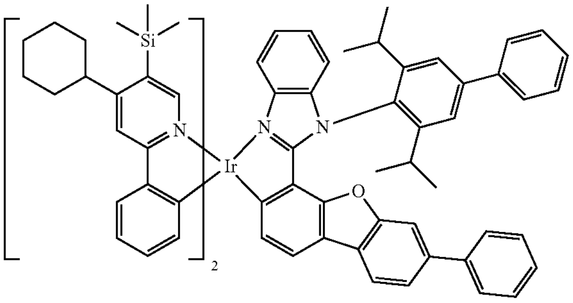
1411
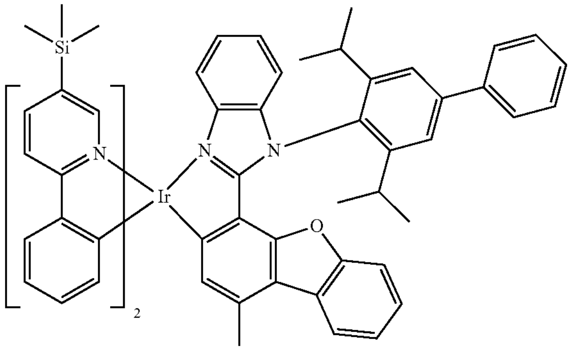

-continued
1412
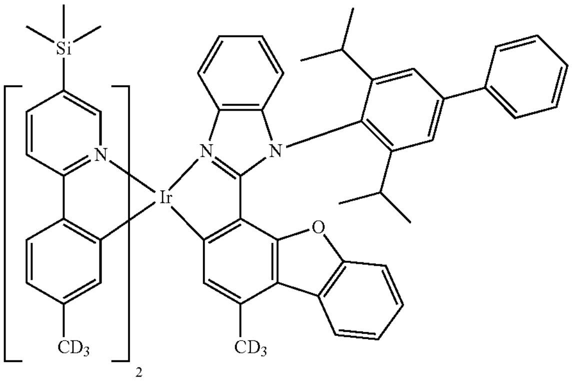
1413
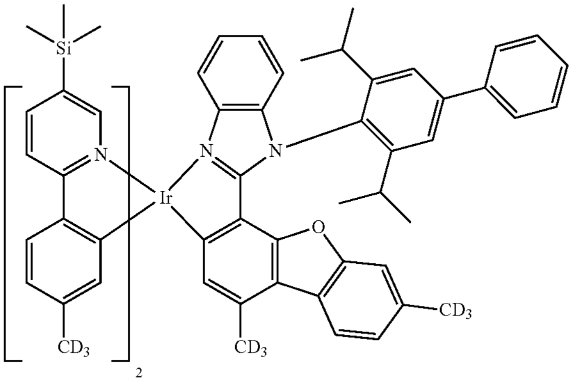
1414
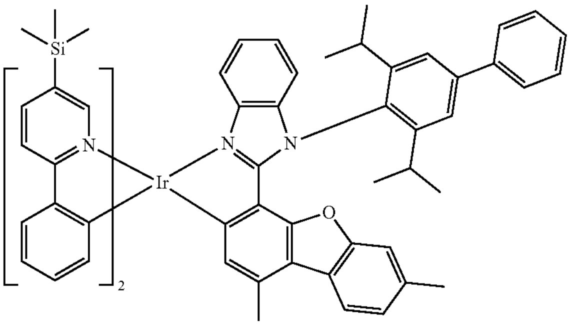
1415
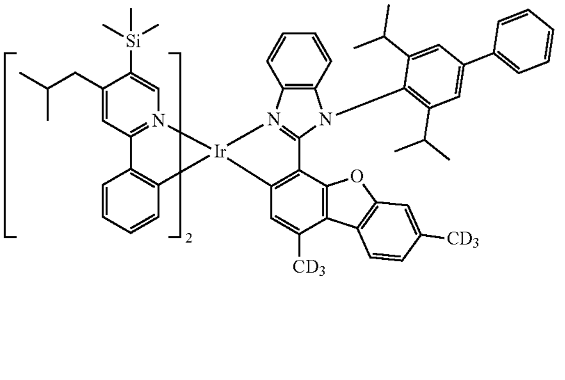
-continued
1416
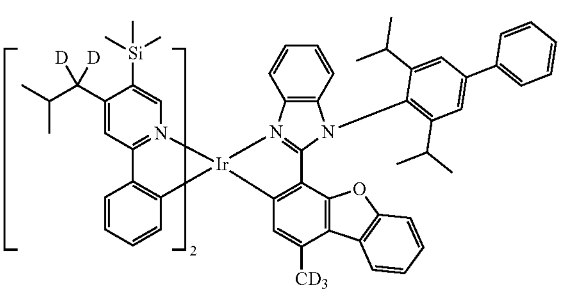
1417
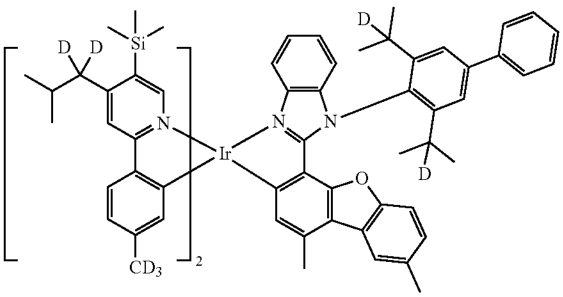
1418
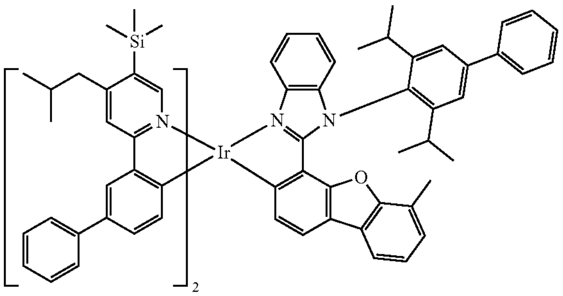
1419
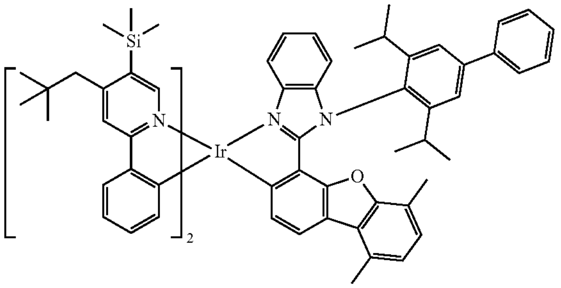
1420
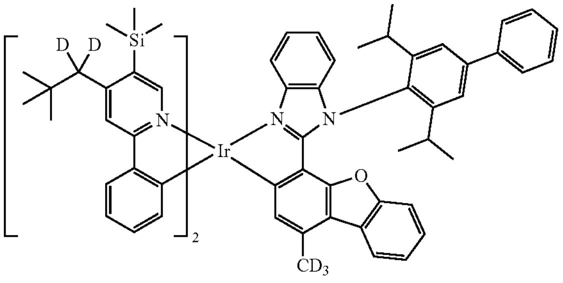

-continued
1421
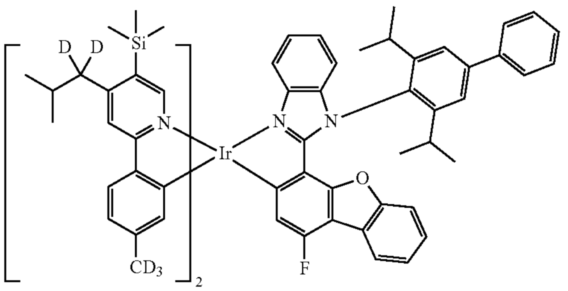
1422
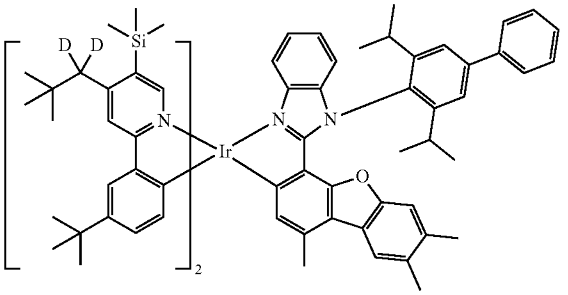
1423
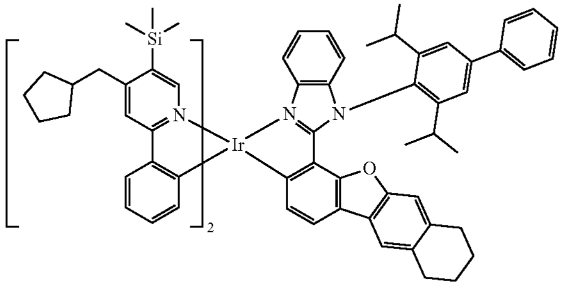
1424
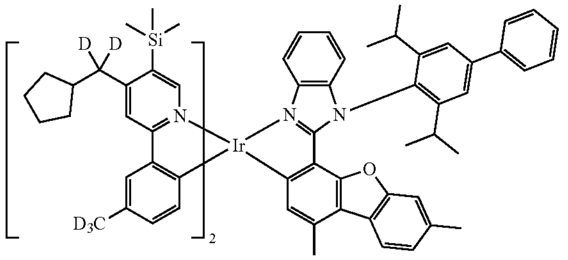
1425
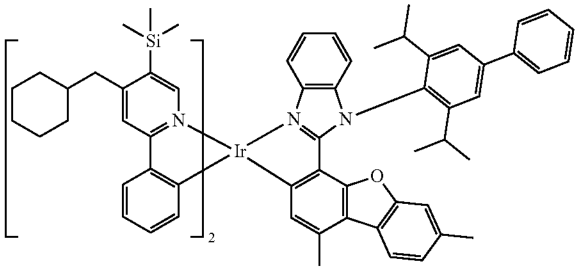
-continued
1426
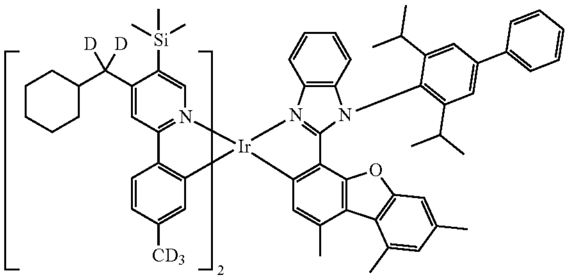
1427
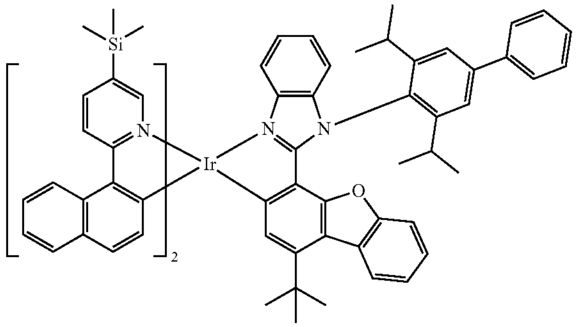
1428
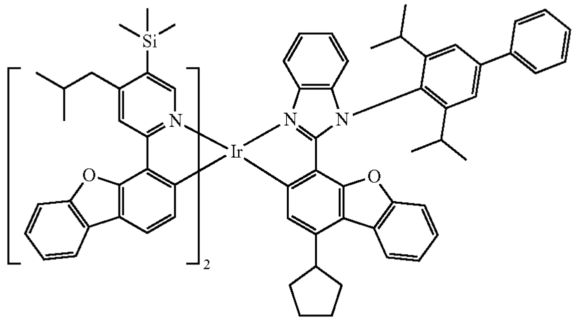
1429
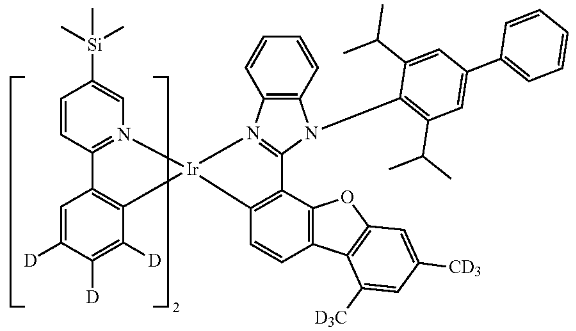

-continued
1430
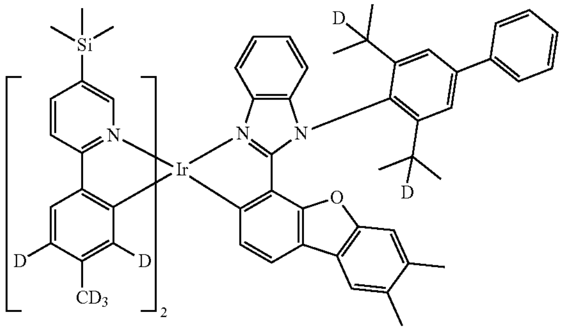
1431
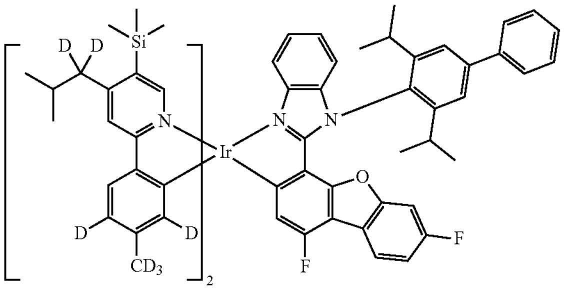
1432
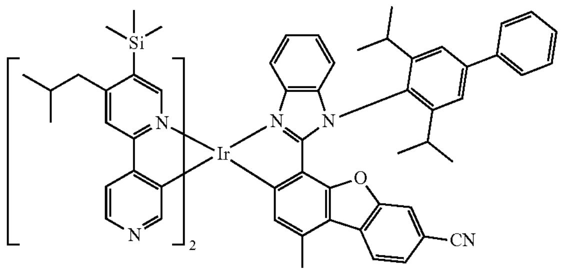
1433
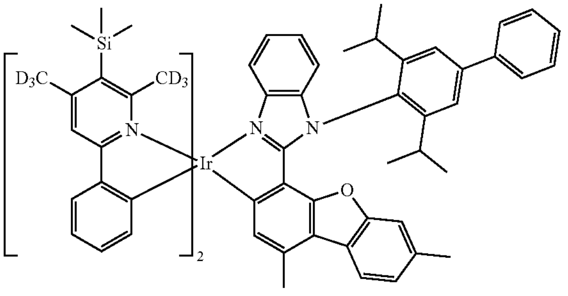
1434
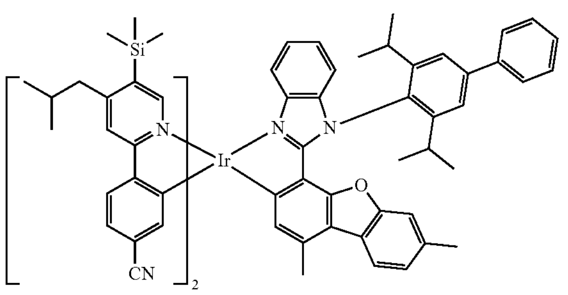
-continued
1435
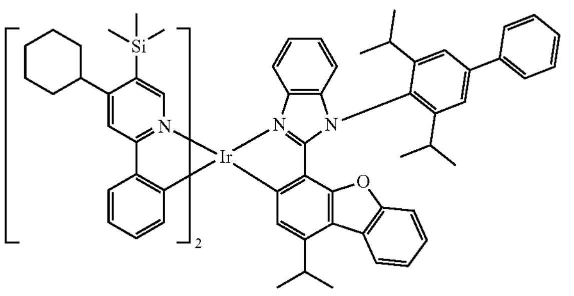
1436
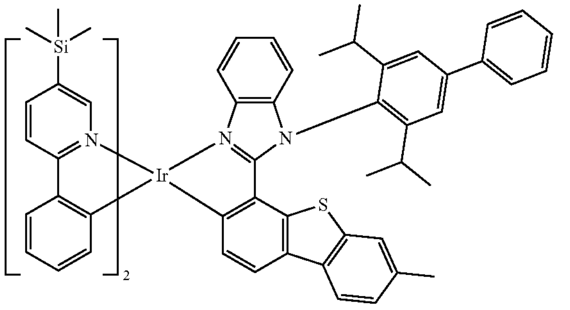
1437
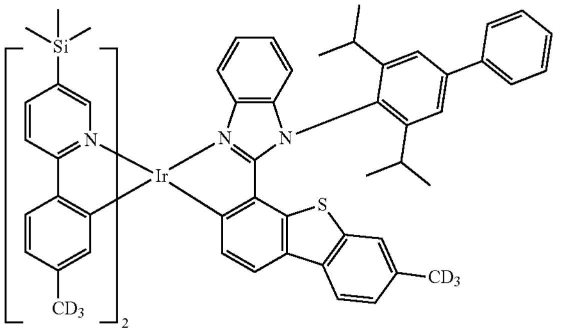
1438
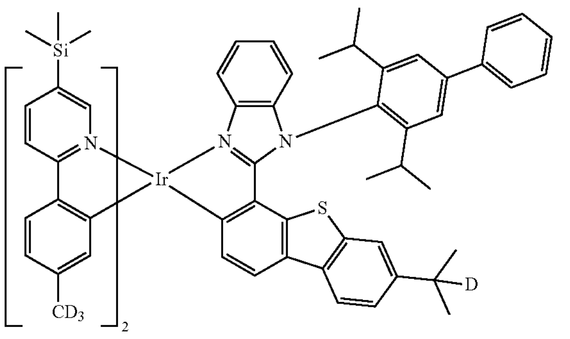

-continued
1439
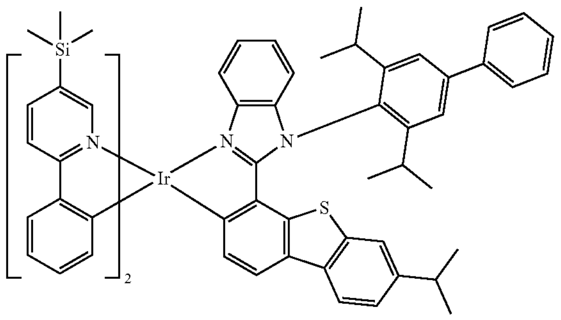
1440
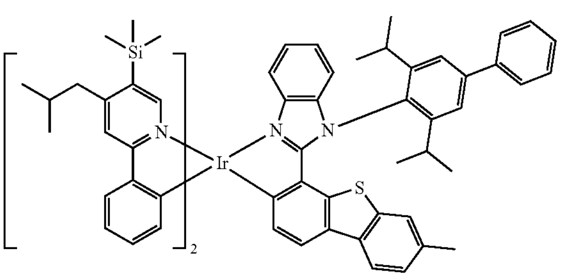
1441
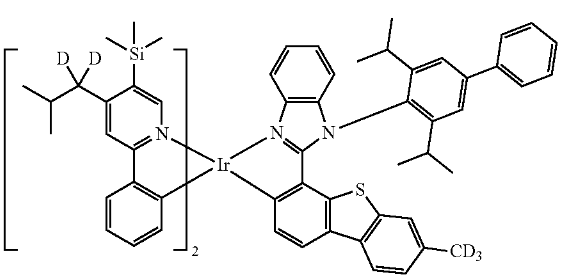
1442
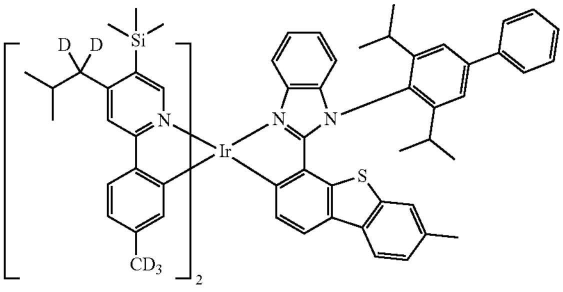
1443
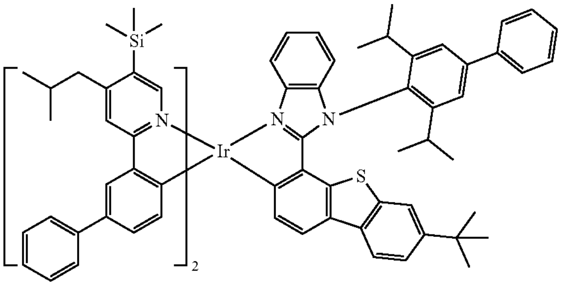
-continued
1444
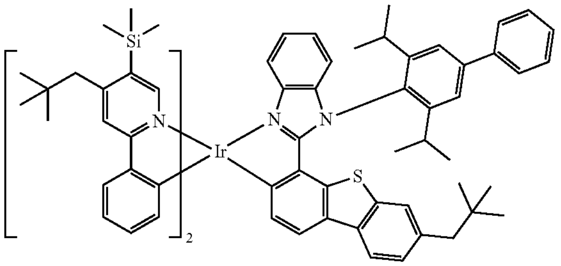
1445
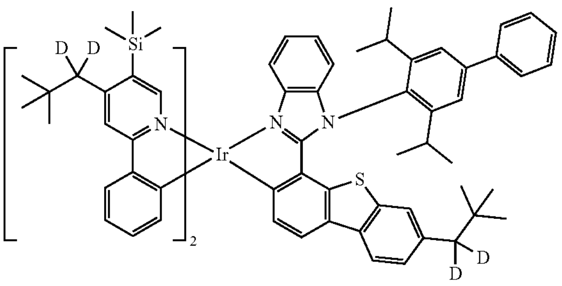
1446
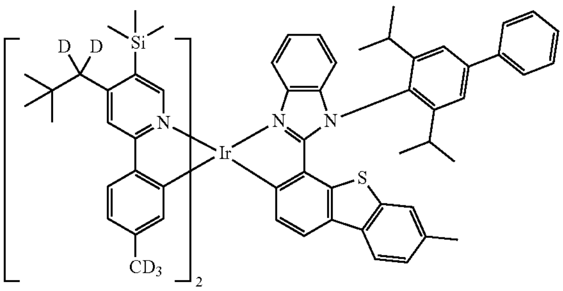
1447
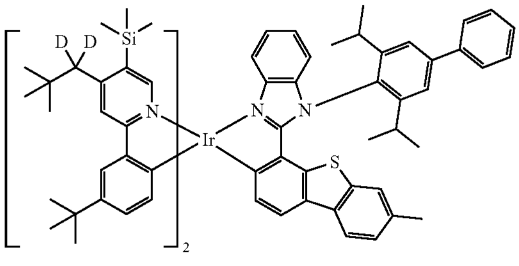
1448
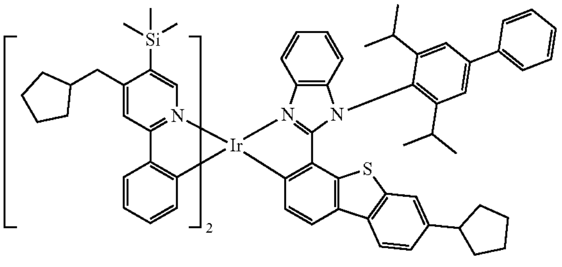

-continued
1449
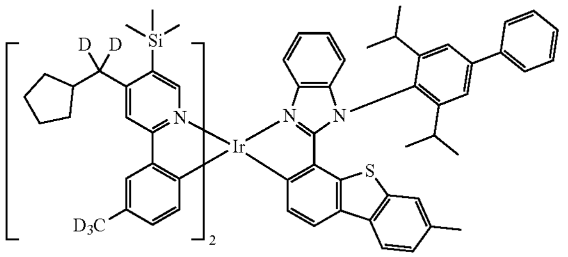
1450
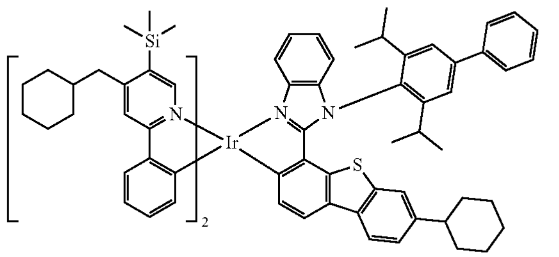
1451
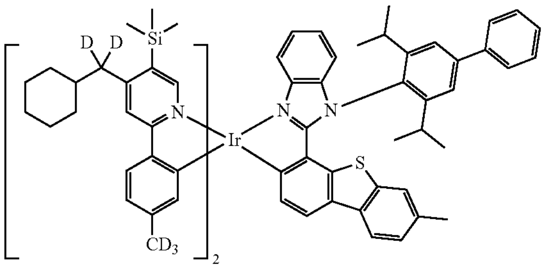
1452
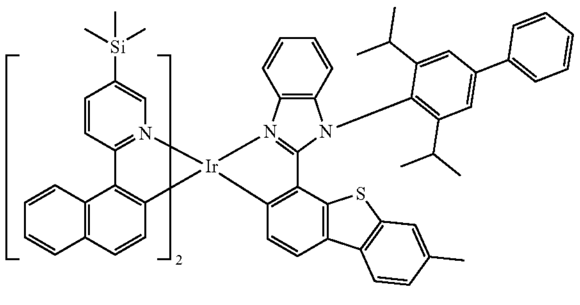
1453
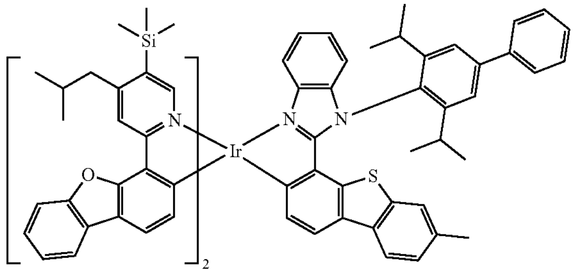
-continued
1454
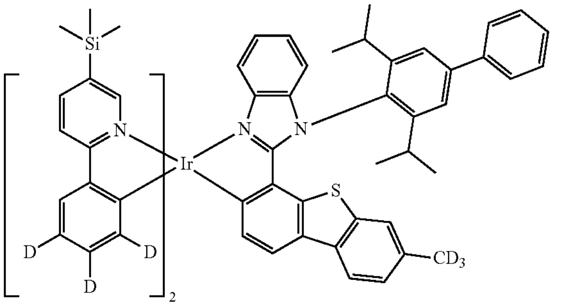
1455
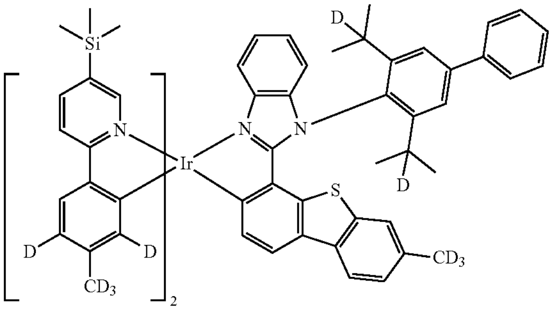
1456
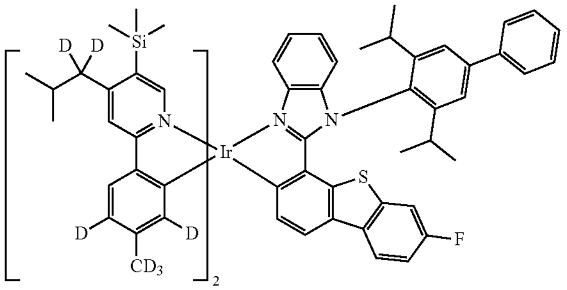
1457
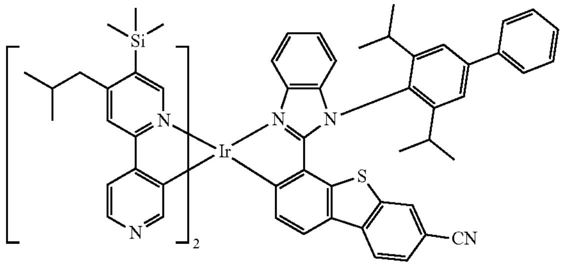
1458
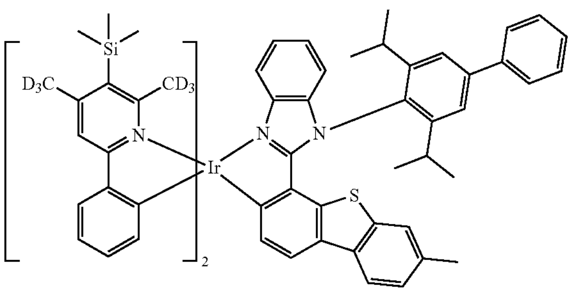

-continued
1459
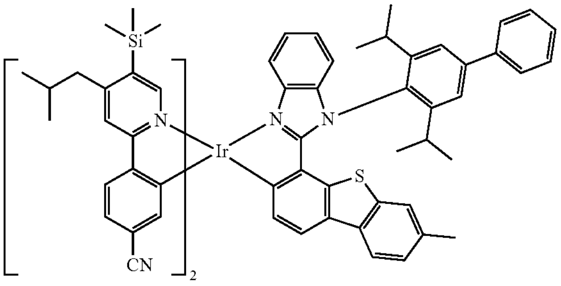
1460
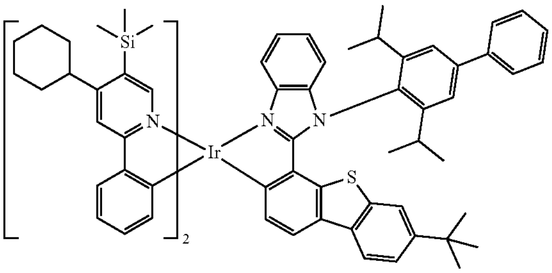
1461
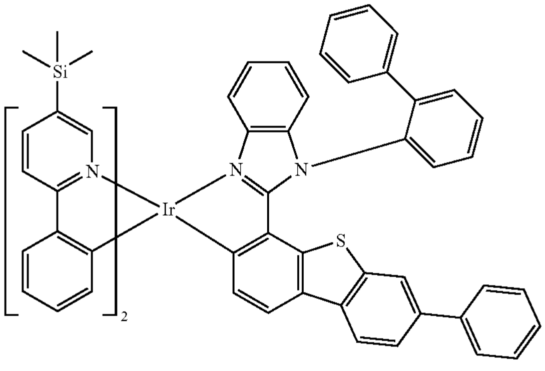
1462
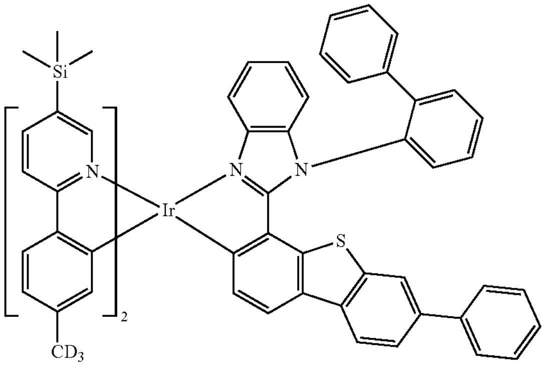
-continued
1463
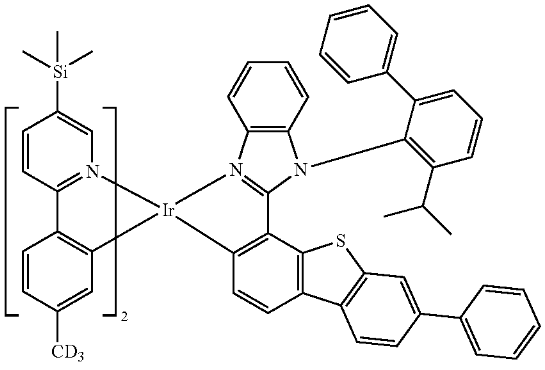
1464
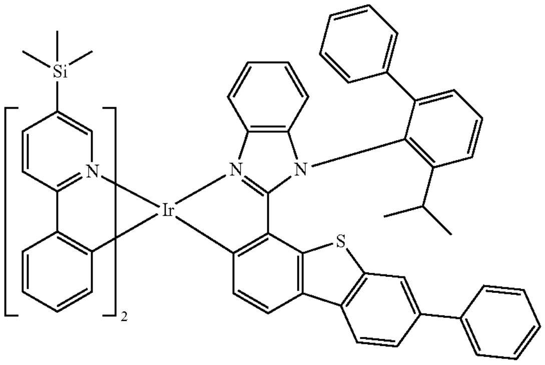
1465
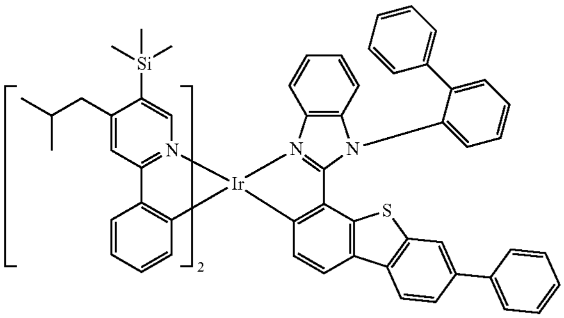
1466
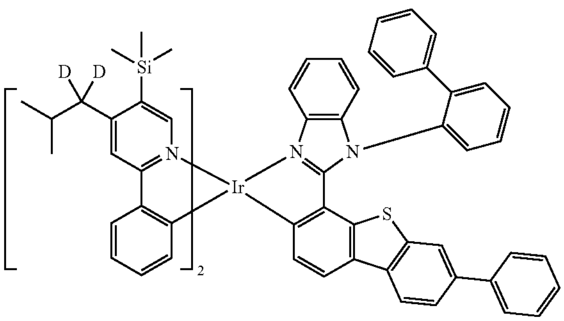

-continued
1467
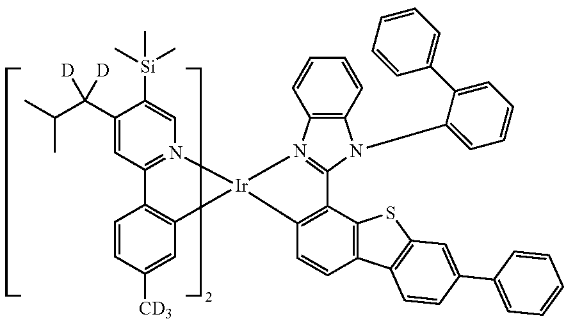
1468
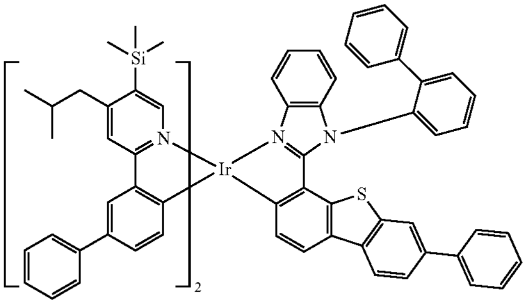
1469
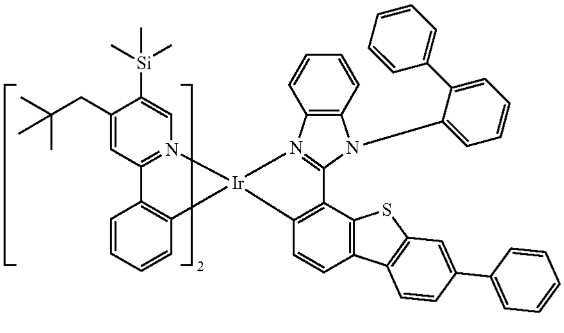
1470
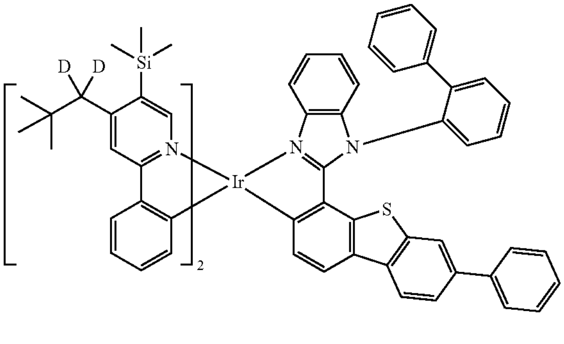
-continued
1471
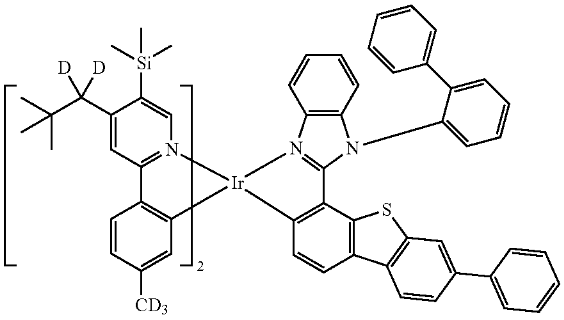
1472
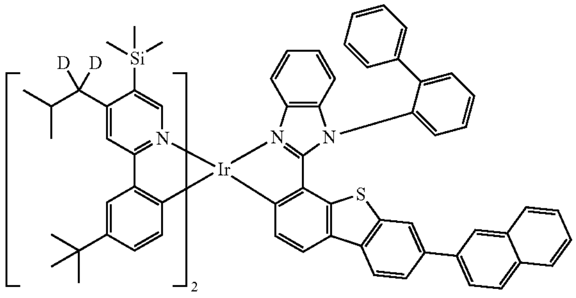
1473
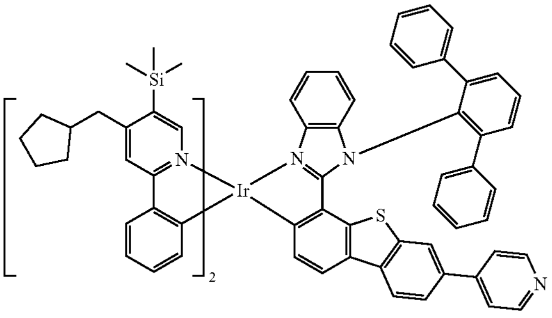
1474
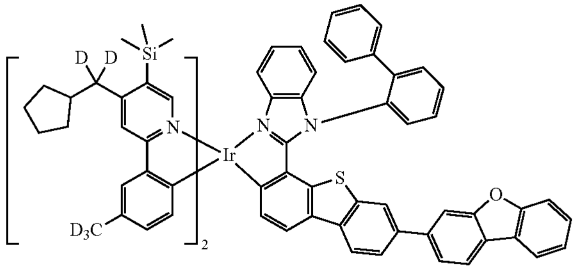
1475
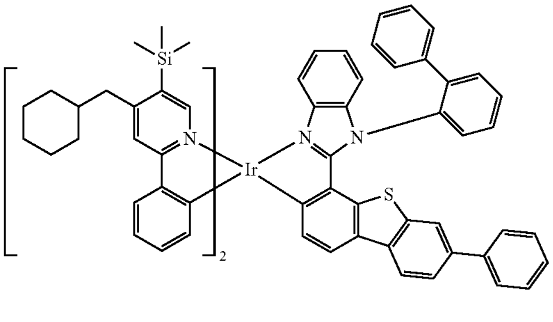

-continued
1476
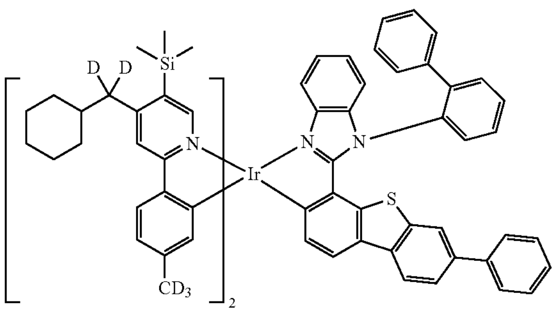
1477
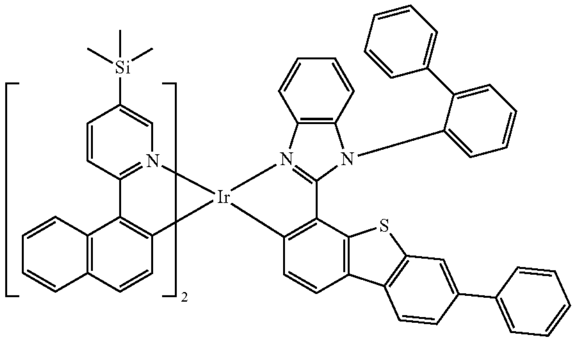
1478
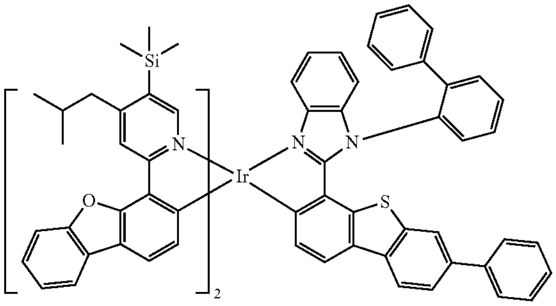
1479
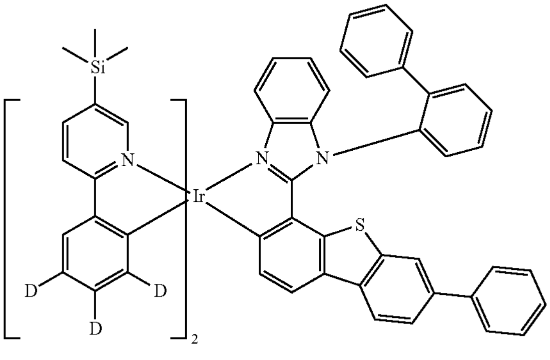
-continued
1480
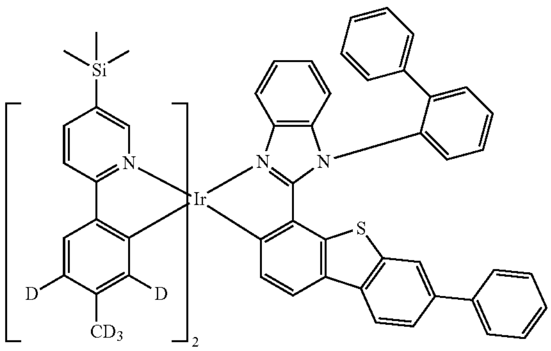
1481
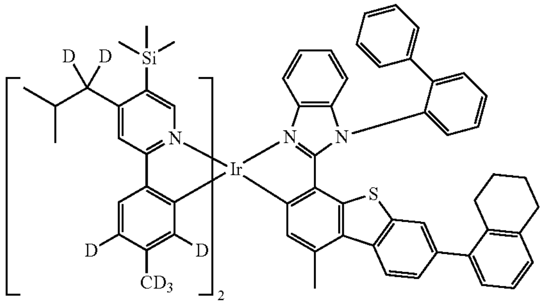
1482
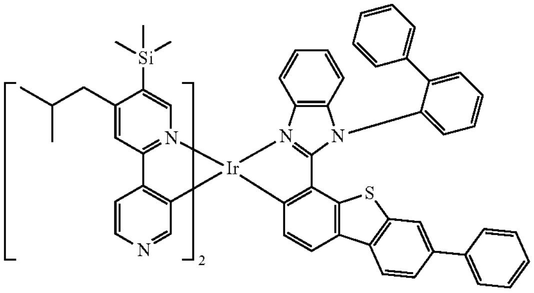
1483
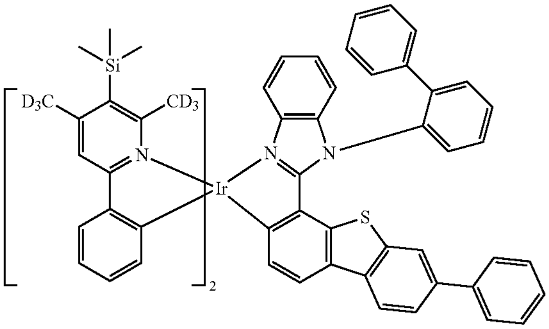

-continued
1484
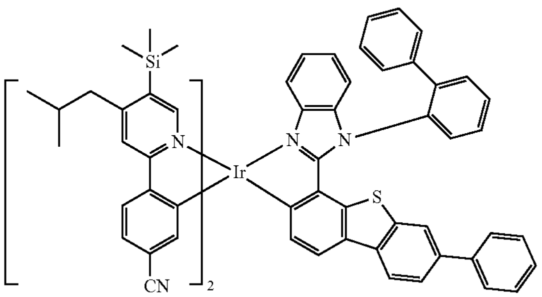
1485
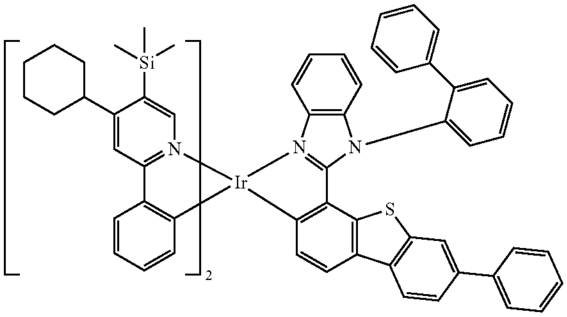
1486
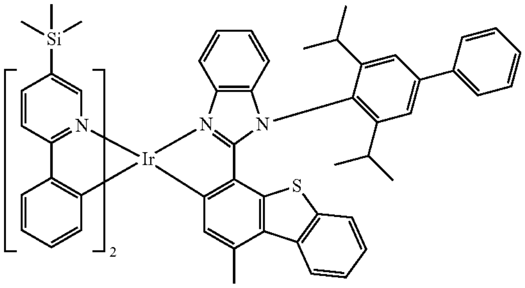
1487
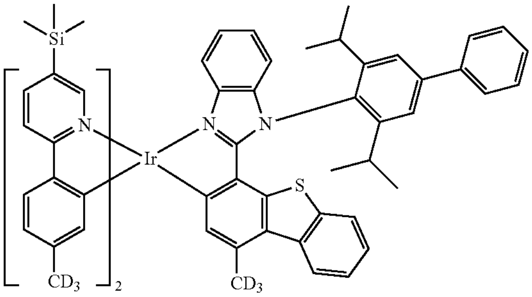
1488
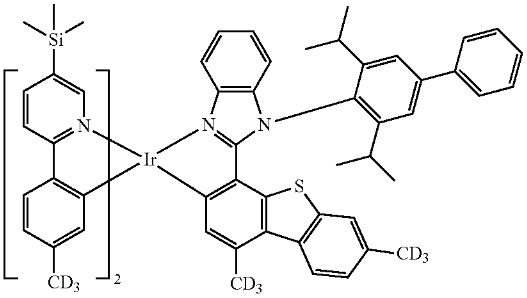
-continued
1489
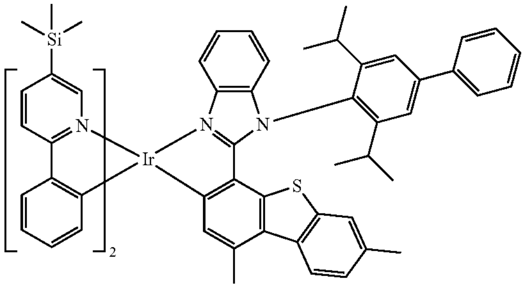
1490
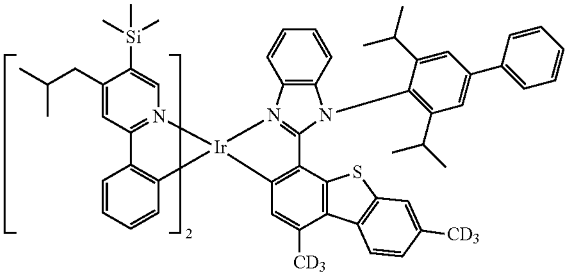
1491
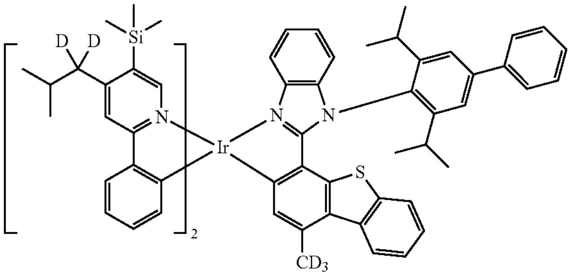
1492
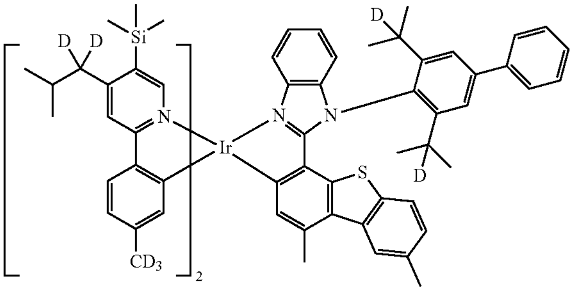
1493
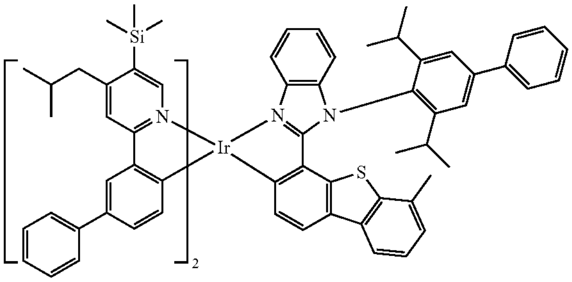

-continued
1494
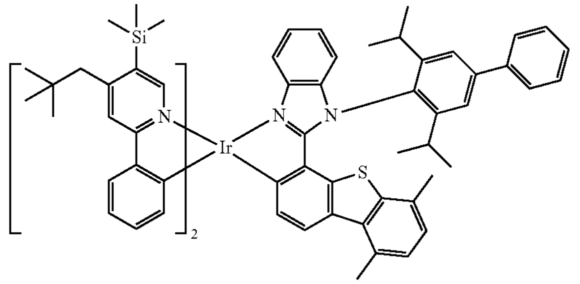
1495
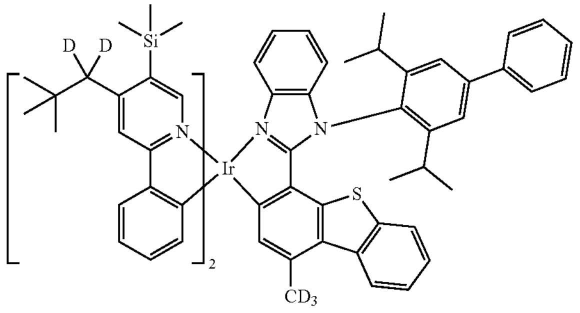
1496
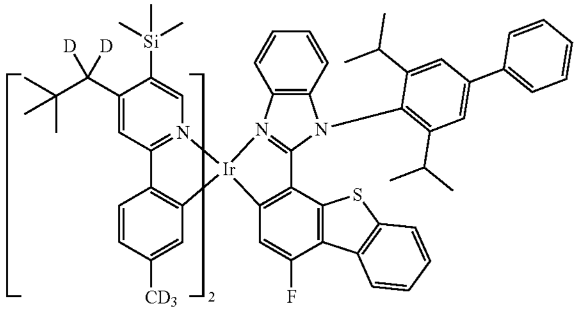
1497
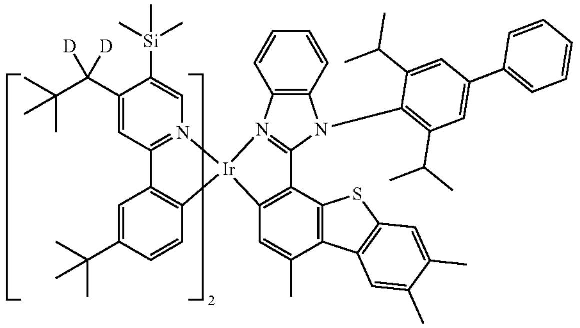
-continued
1498
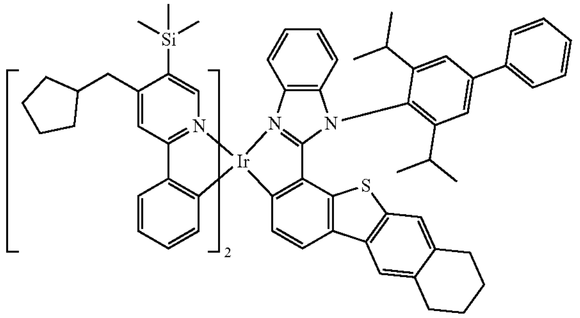
1499
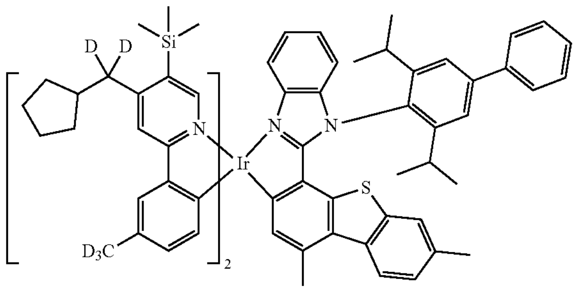
1500
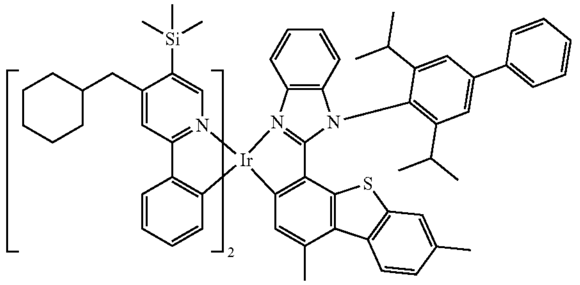
1501
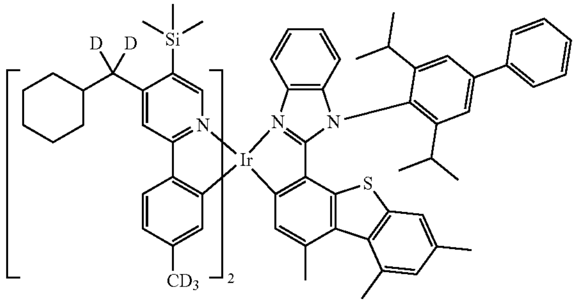

-continued
1502
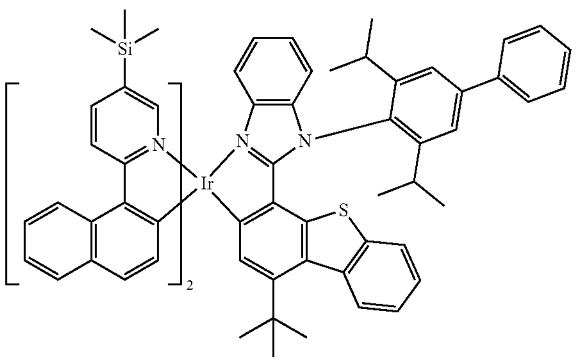
1503
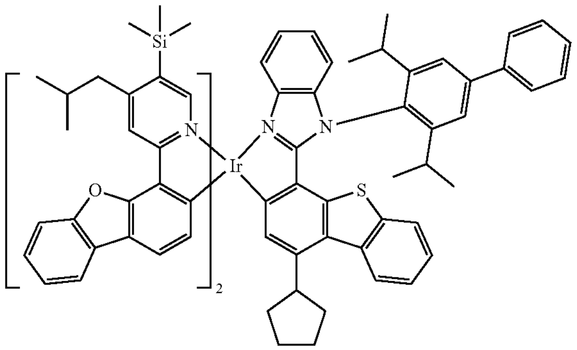
1504
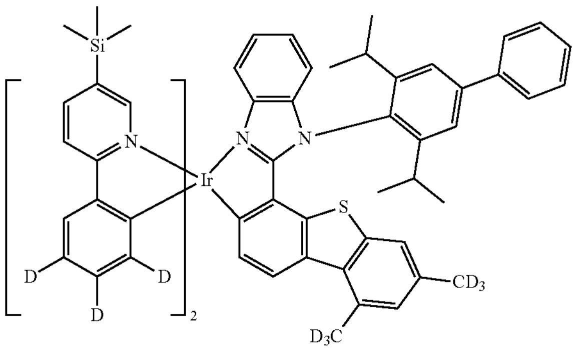
1505
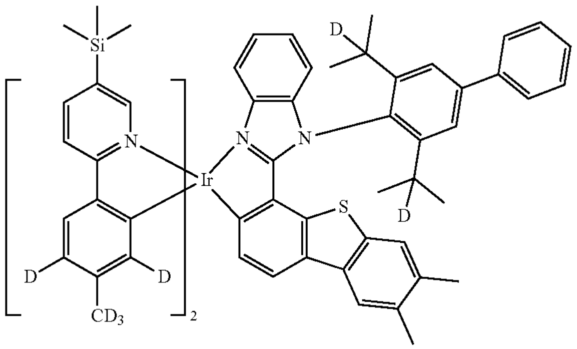
-continued
1506
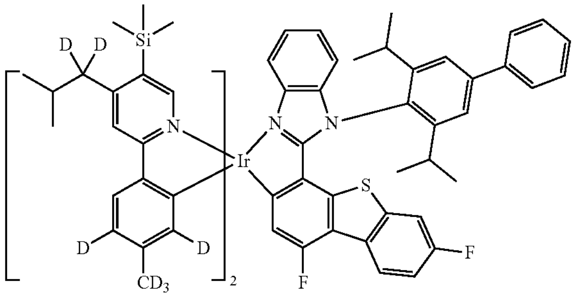
1507
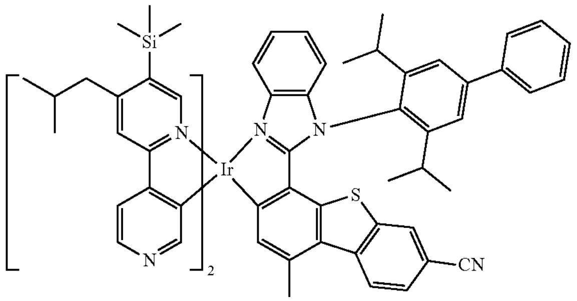
1508
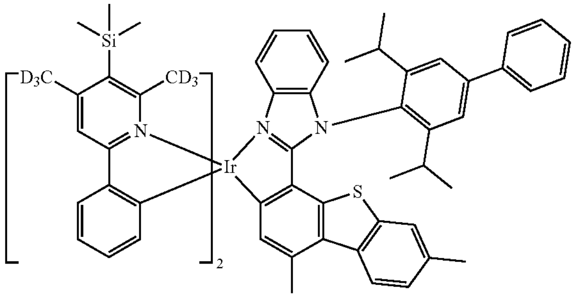
1509
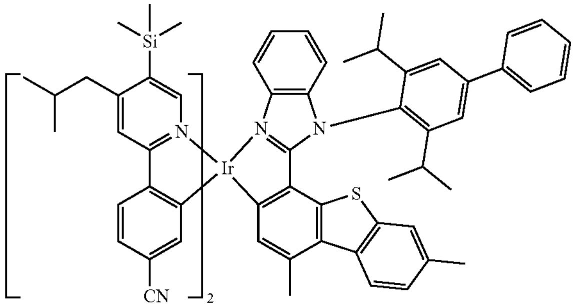
1510
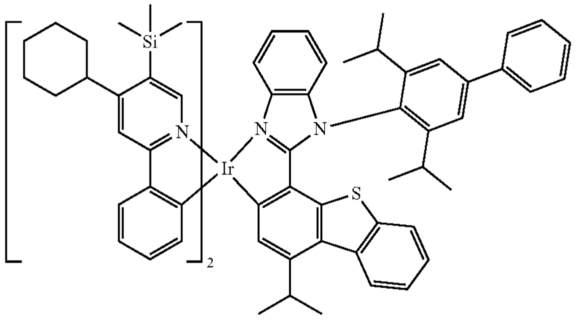

-continued
1511
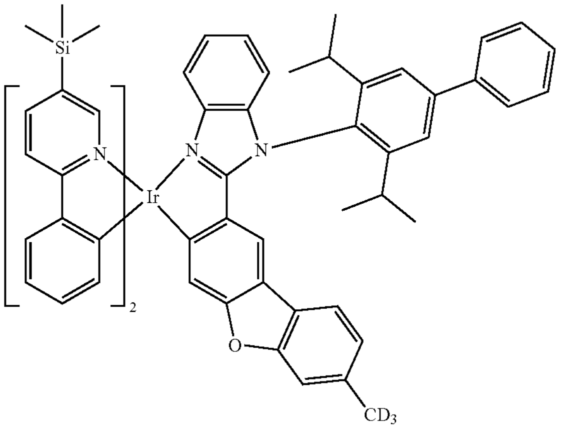
1512
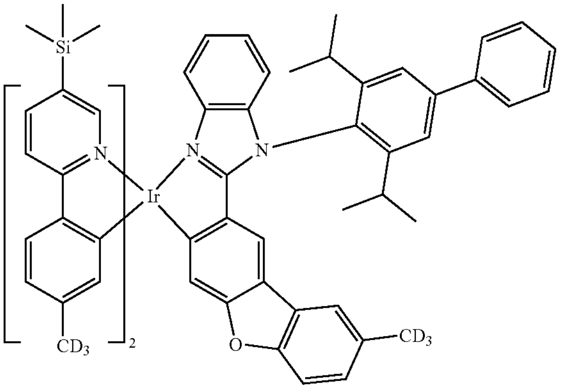
1513
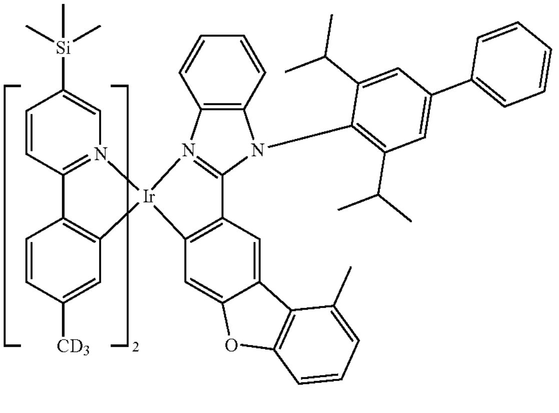
-continued
1514
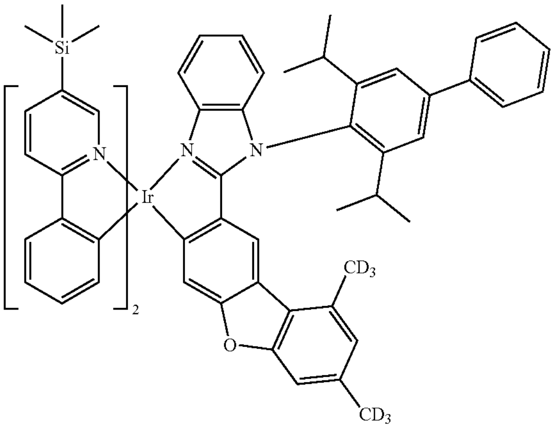
1515
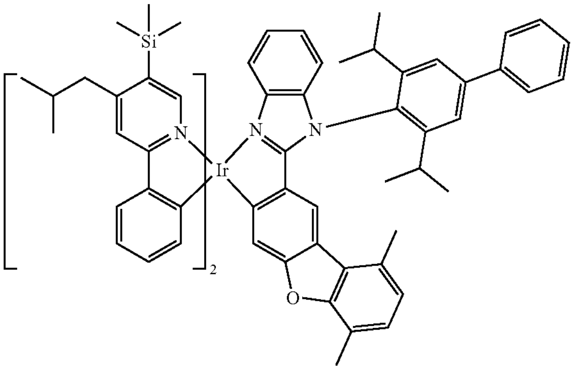
1516
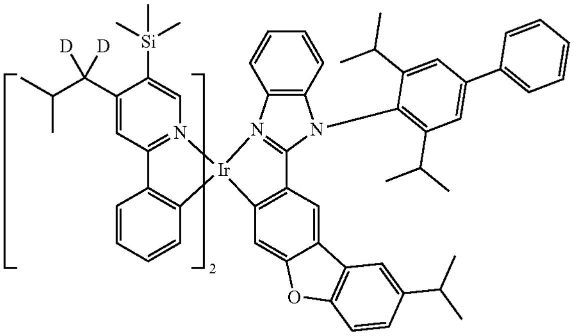
1517
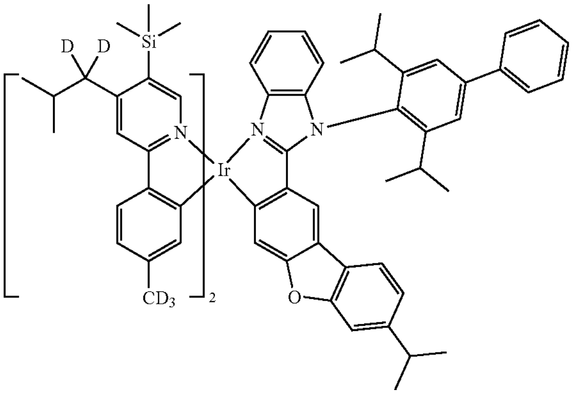

-continued
1518
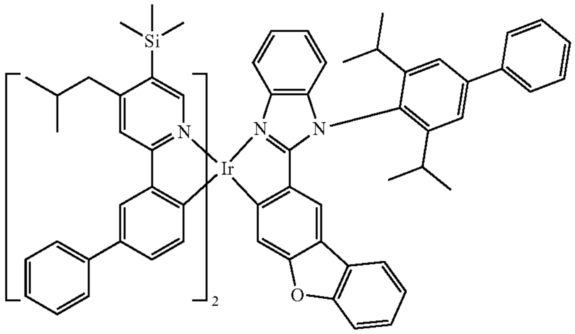
1519
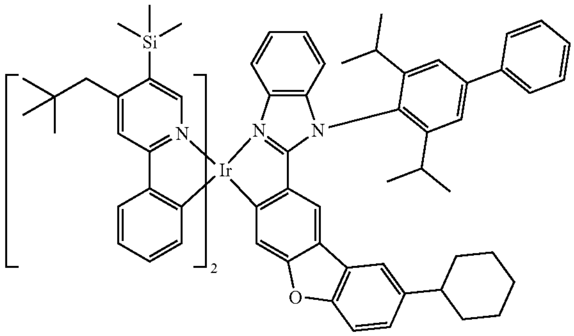
1520
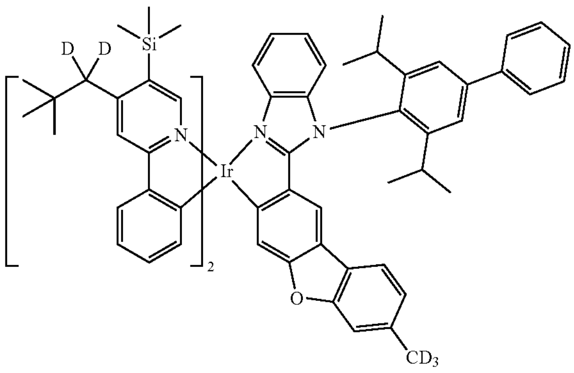
1521
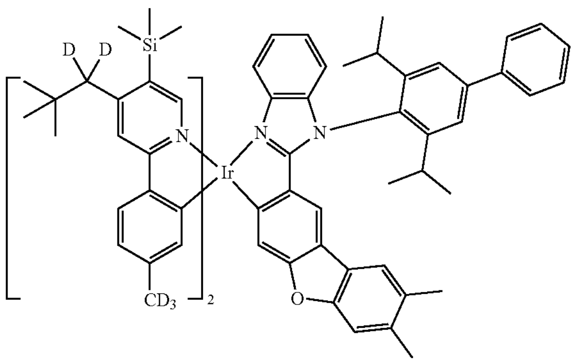
-continued
1522
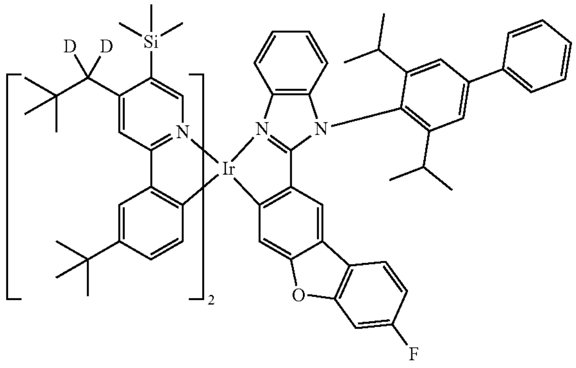
1523
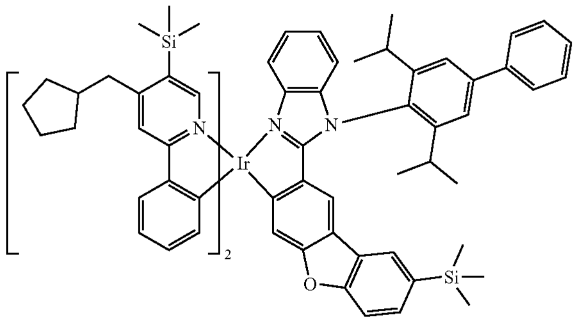
1524
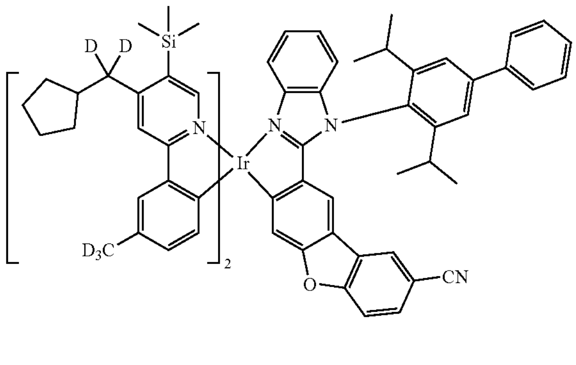
1525
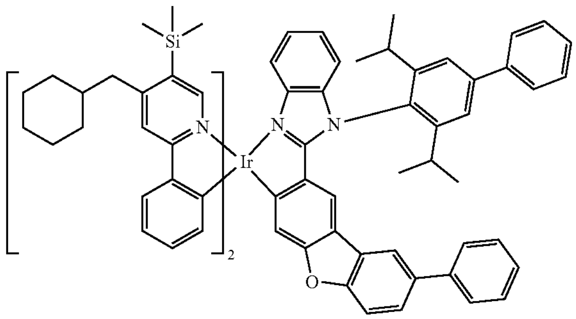

1526
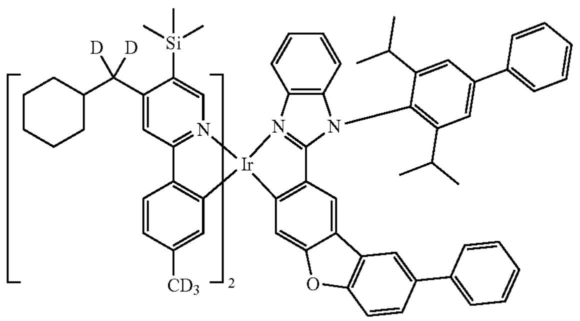
1527
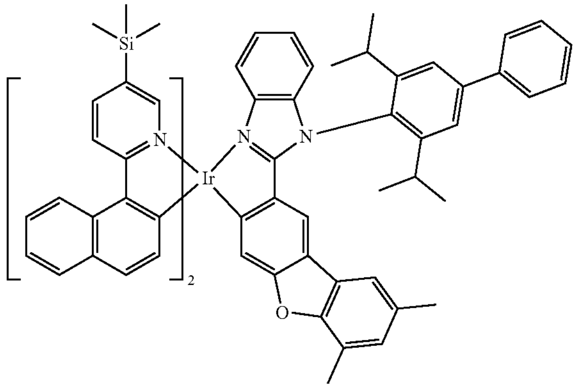
1528
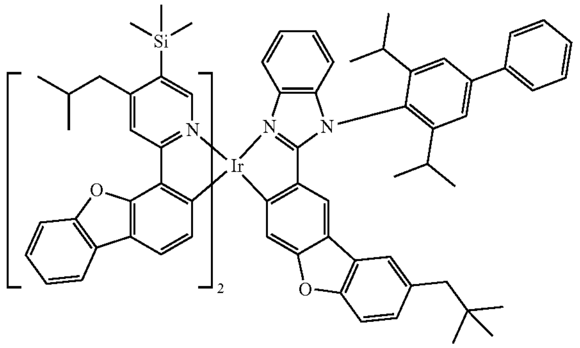
1529
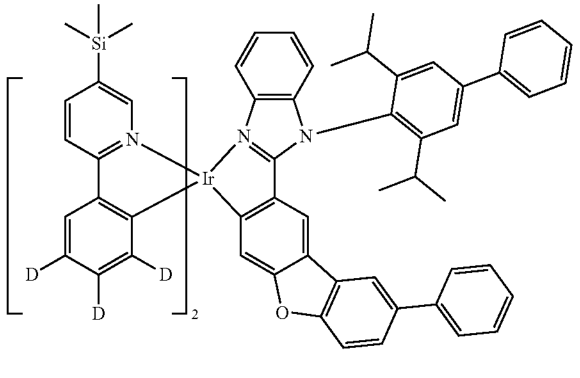
1530
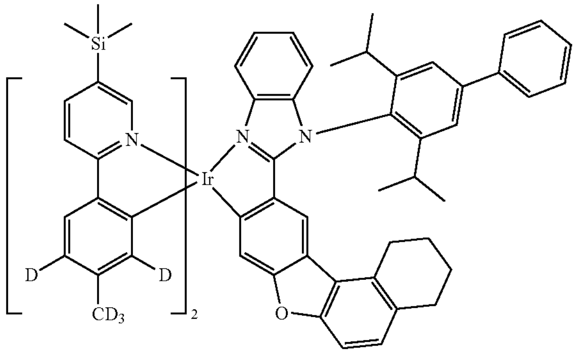
1531
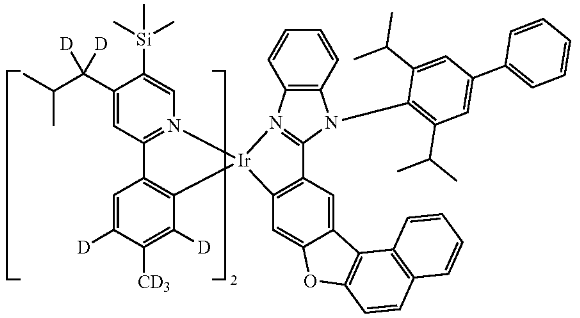
1532
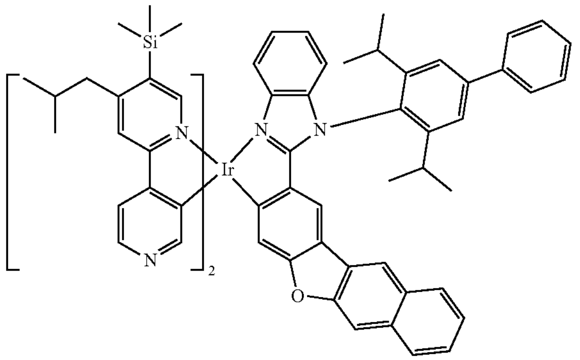
1533
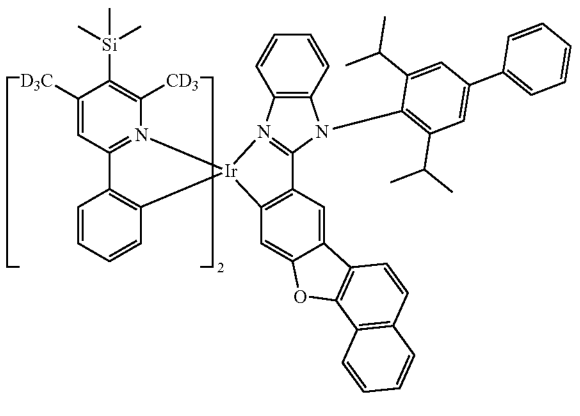

-continued
1534
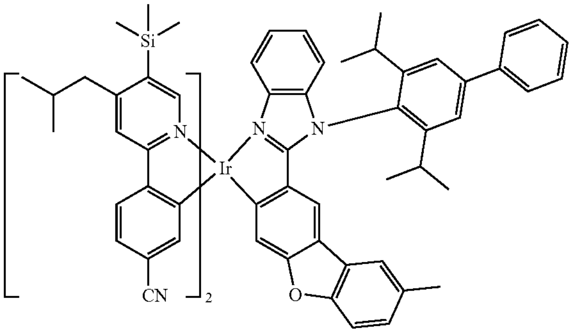
1535
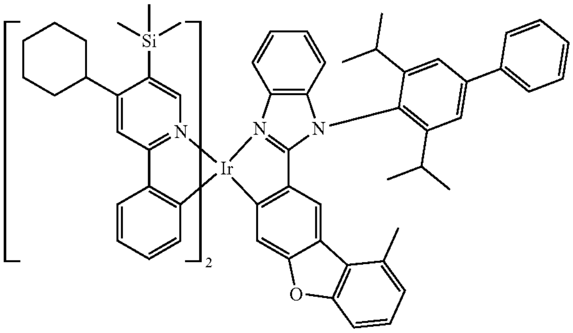
1536
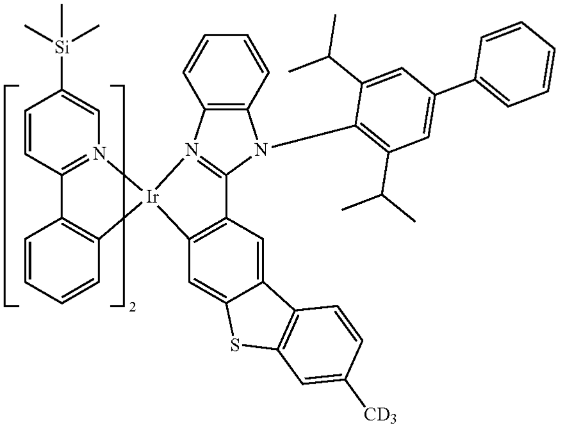
1537
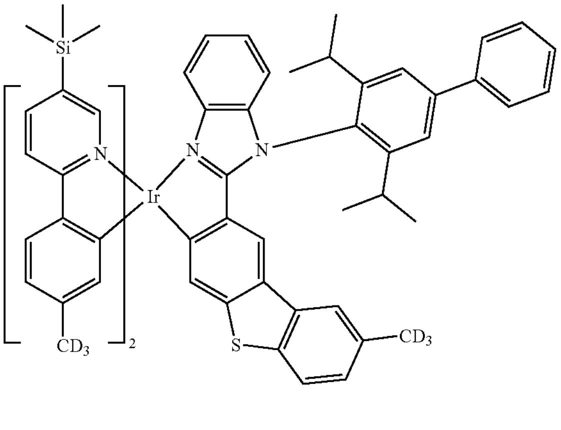
-continued
1538
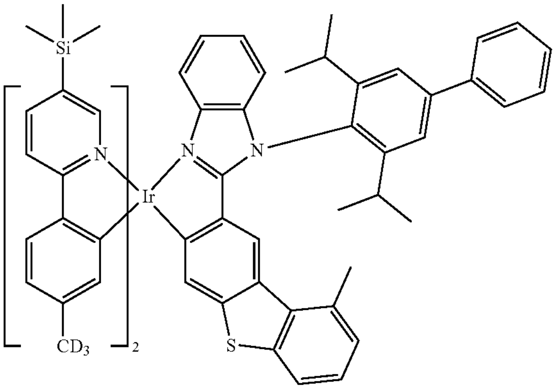
1539
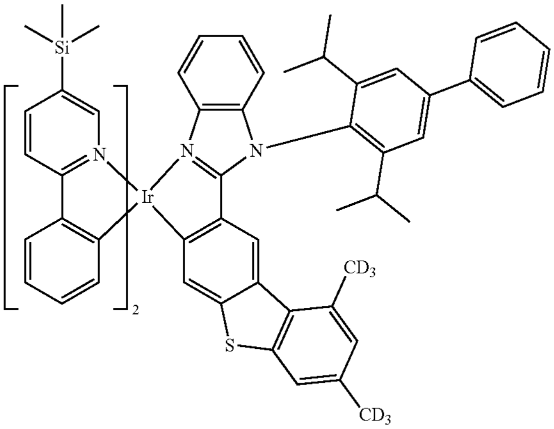
1540
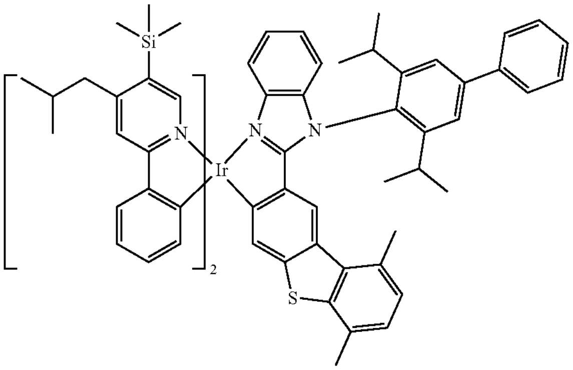
1541
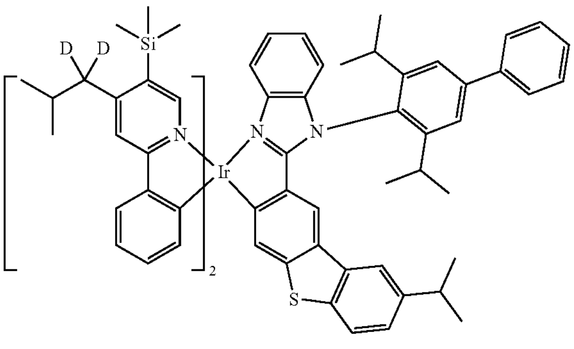

-continued
1542
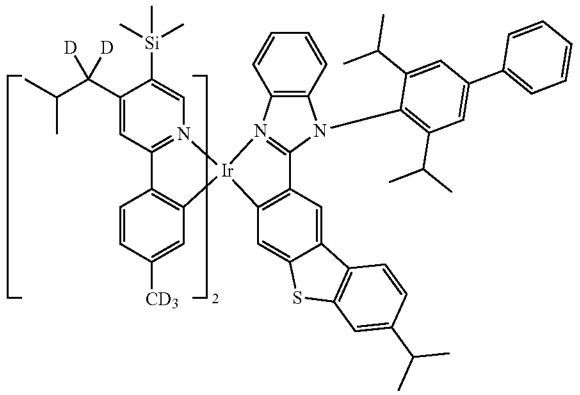
1543
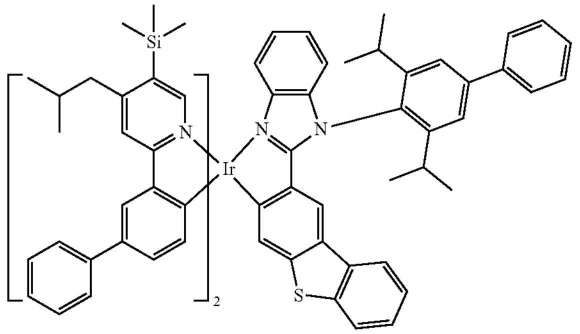
1544
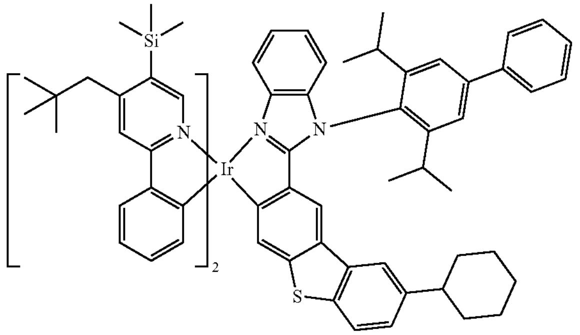
1545
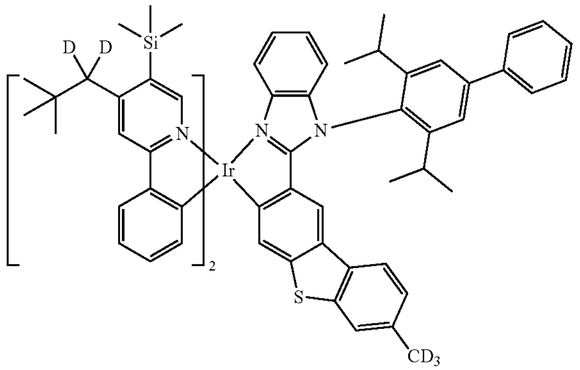
-continued
1546
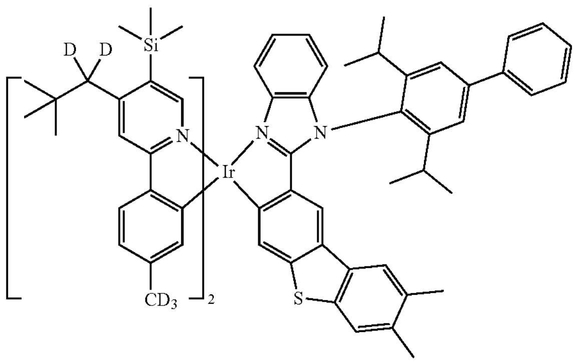
1547
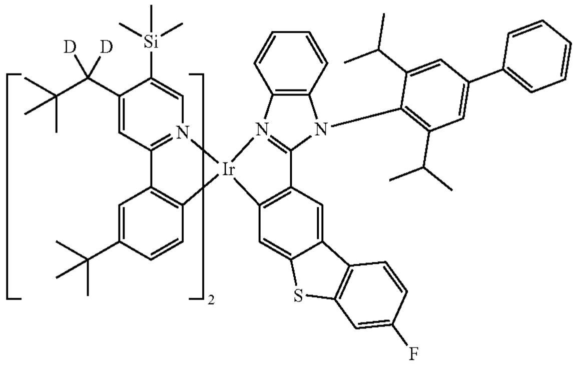
1548
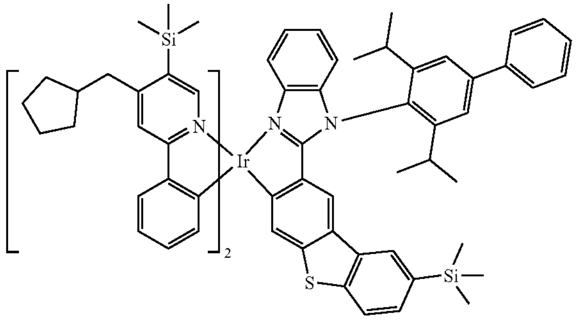
1549
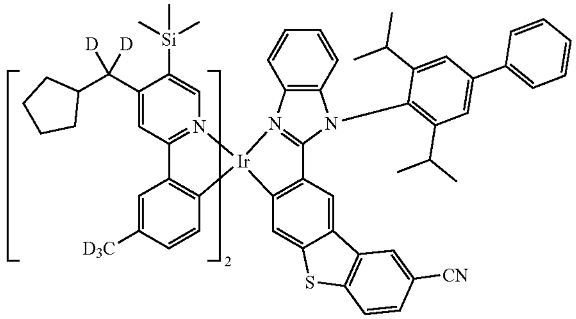

1550
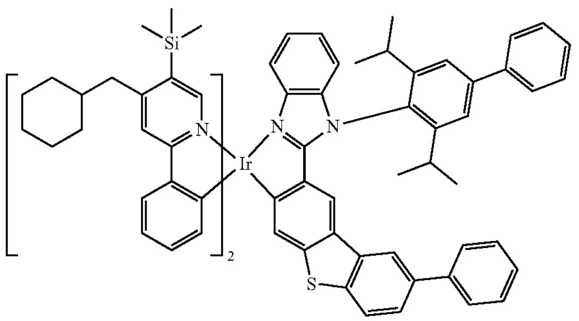
1551
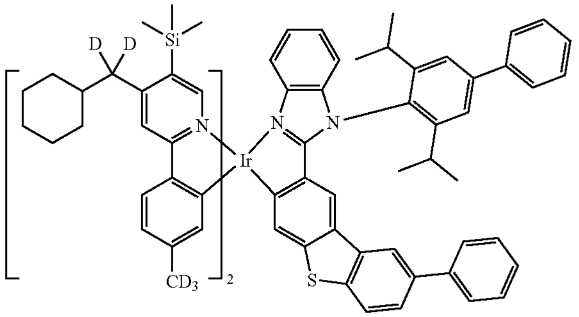
1552
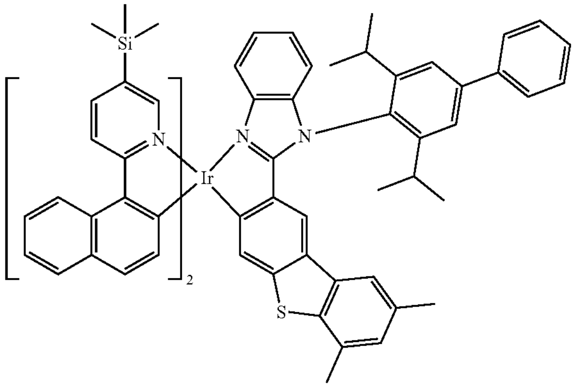
1553
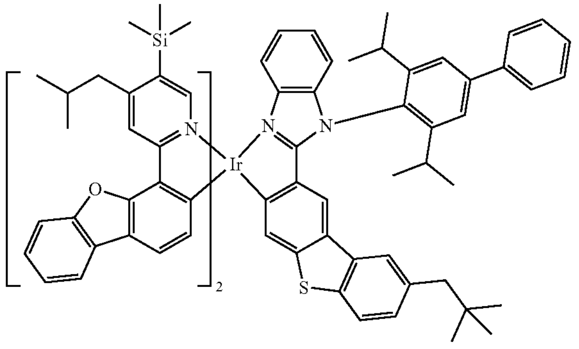
1554
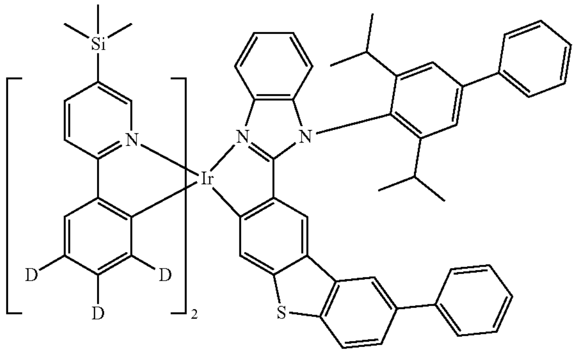
1555
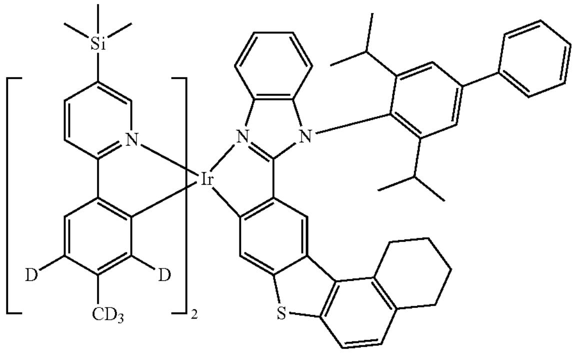
1556
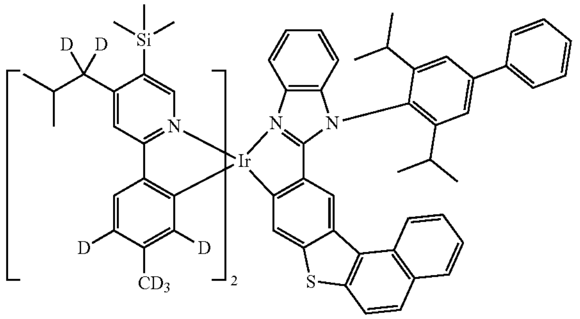
1557
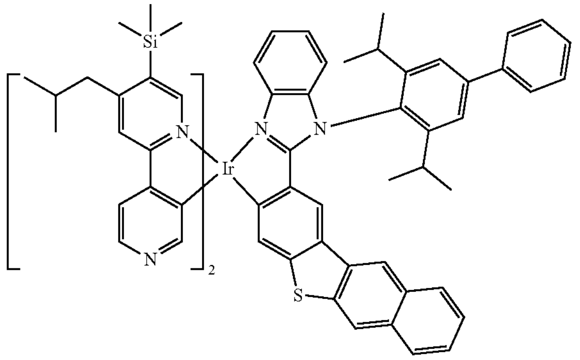

1558
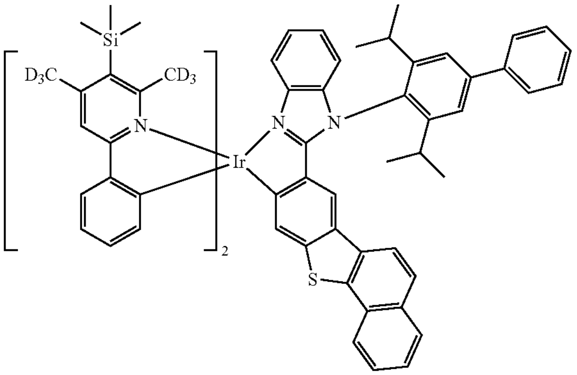
1559
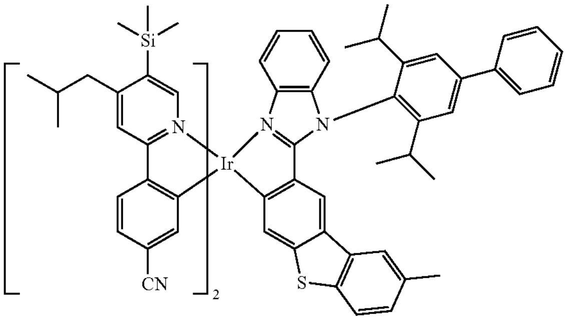
1560
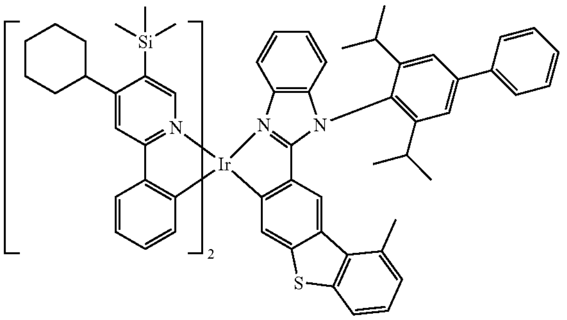
1561
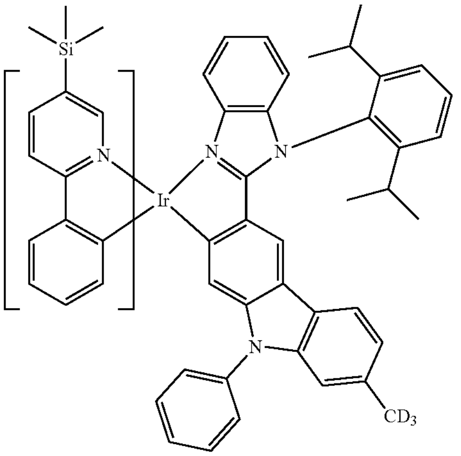
-continued
1562
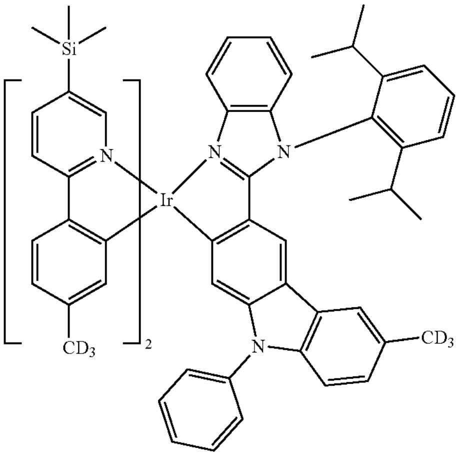
1563
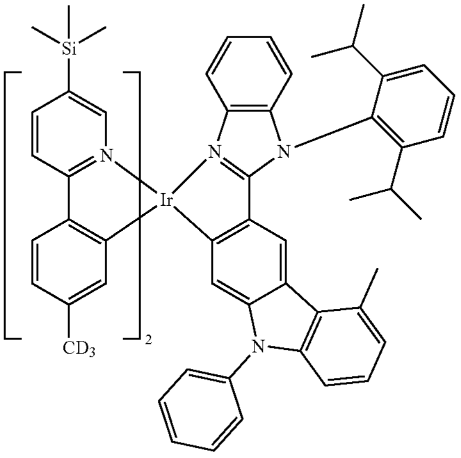
1564
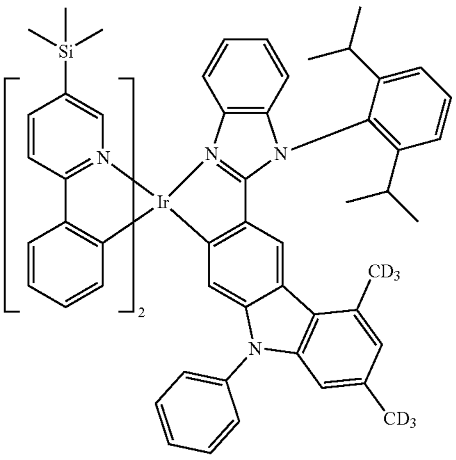

-continued
1565
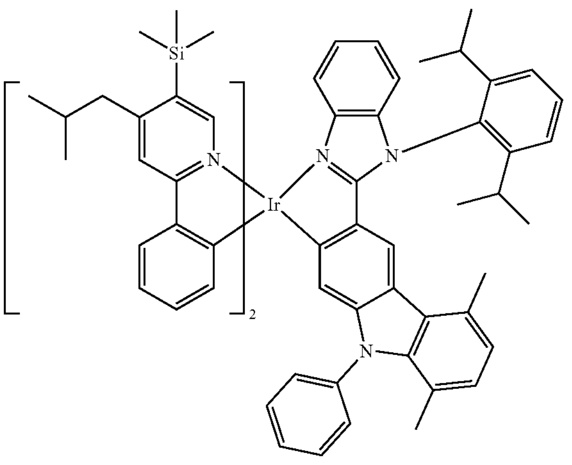
1566
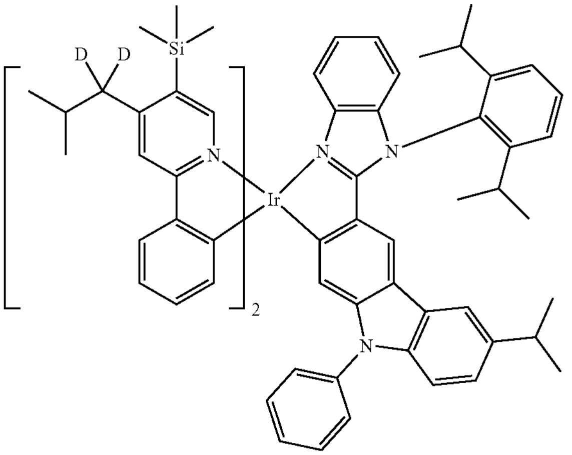
1567
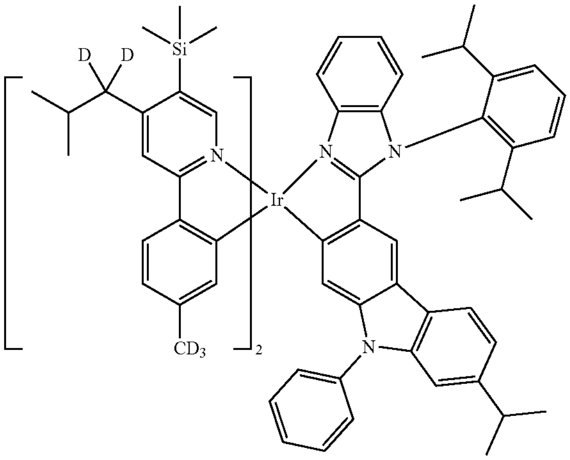
-continued
1568
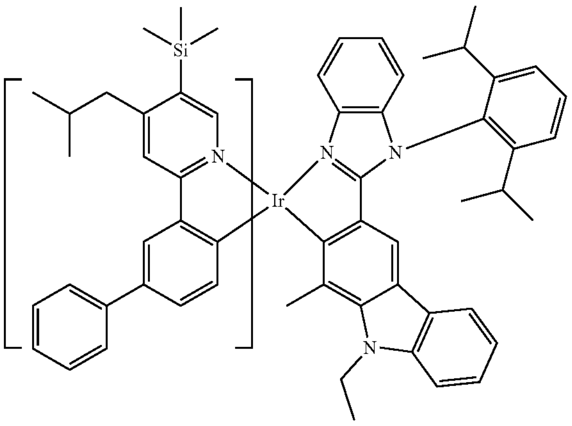
1569
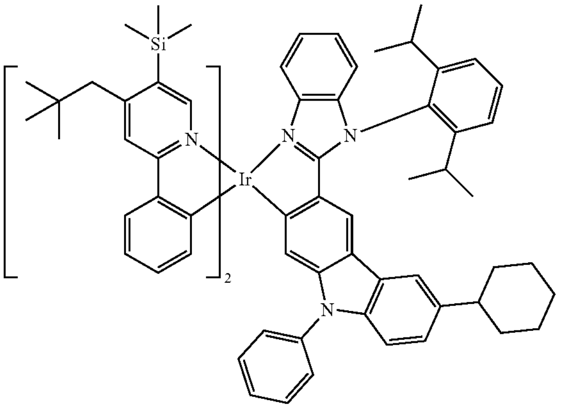
1570
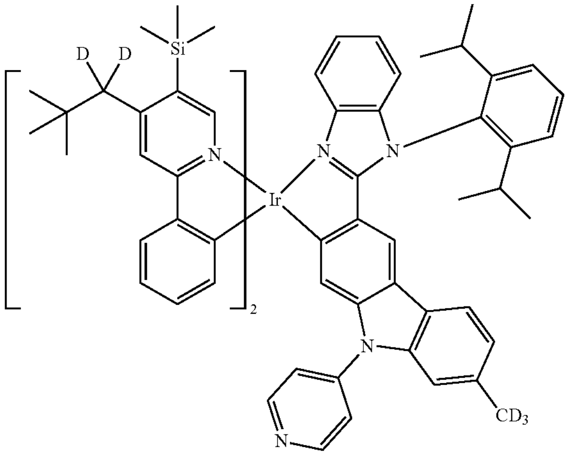

-continued
1571
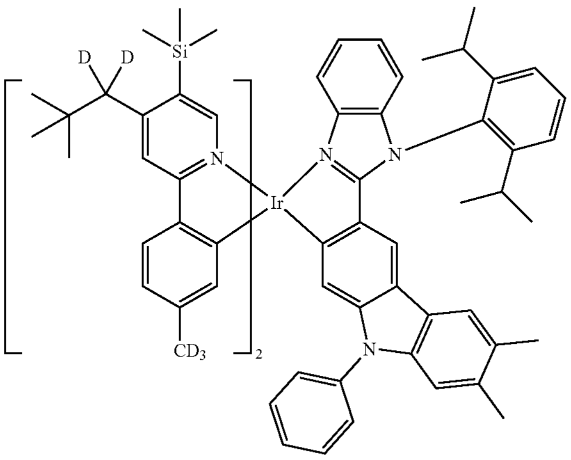
1572
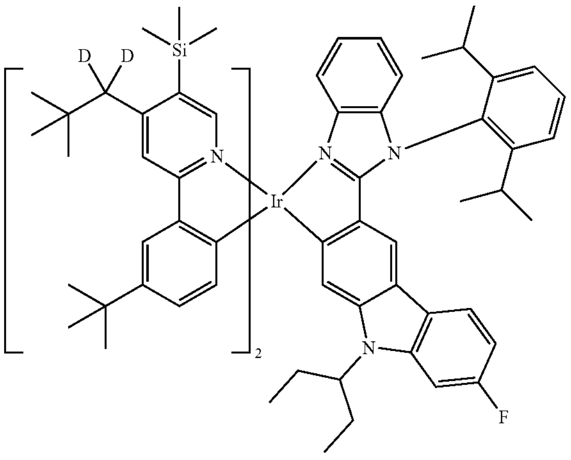
1573
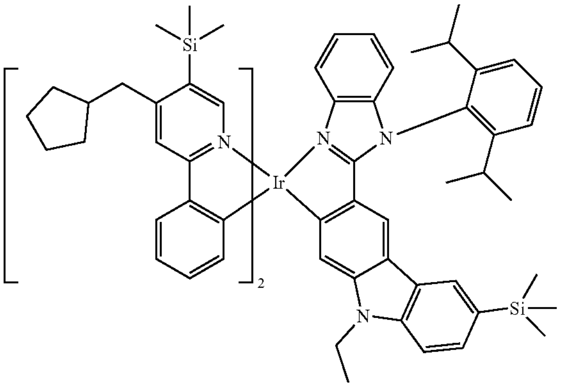
-continued
1574
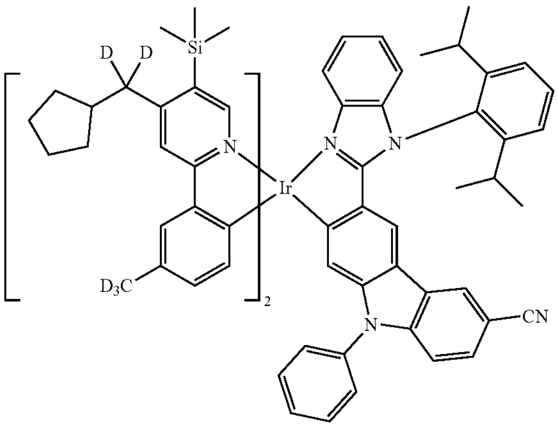
1575
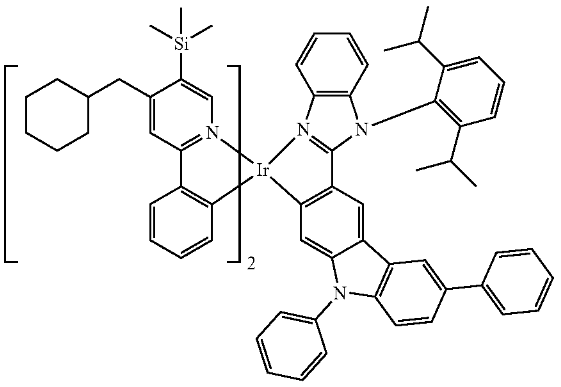
1576
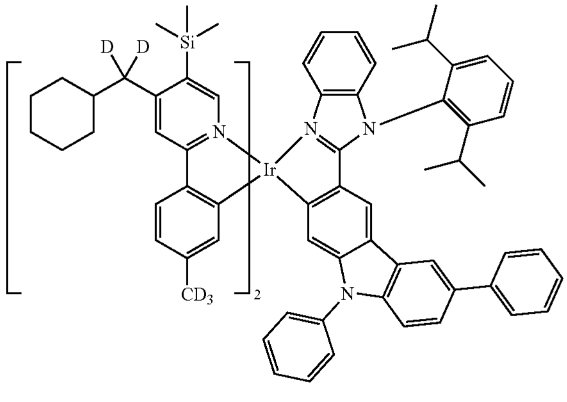

-continued
1577
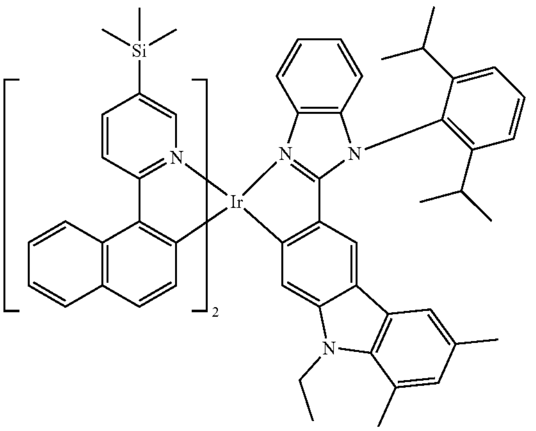
1578
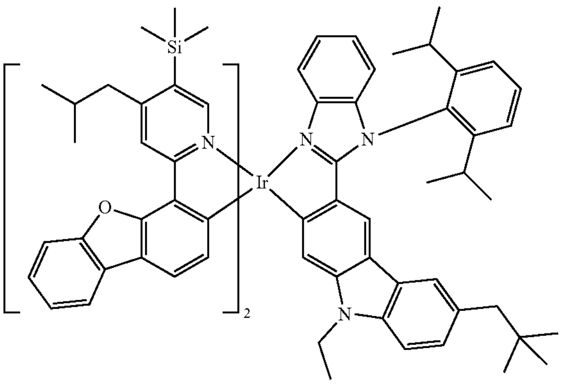
1579
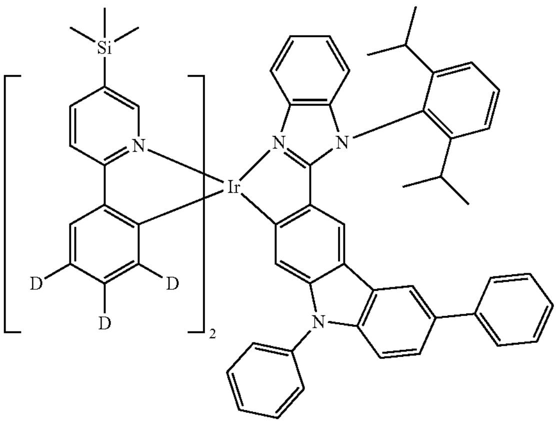
-continued
1580
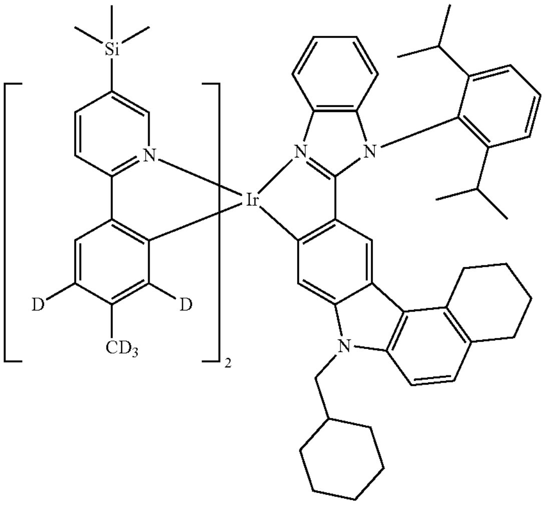
1581
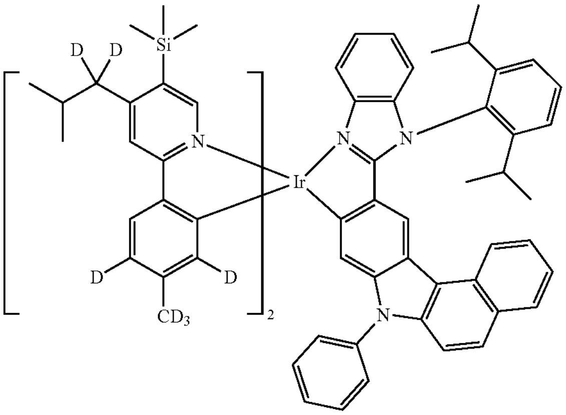
1582
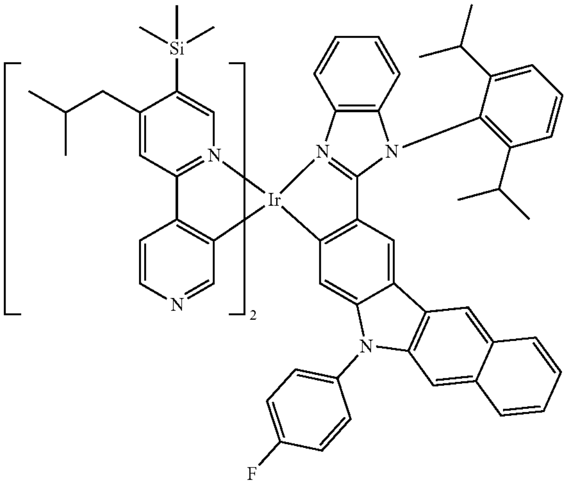

-continued
1583
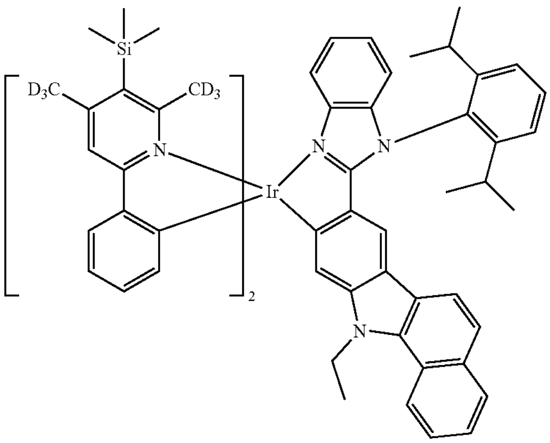
1584
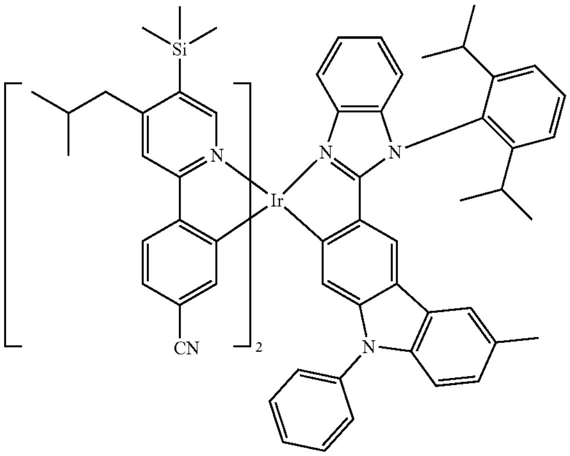
1585
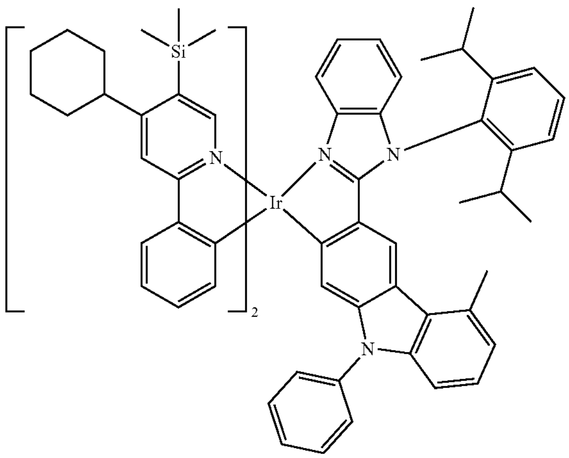
-continued
1586
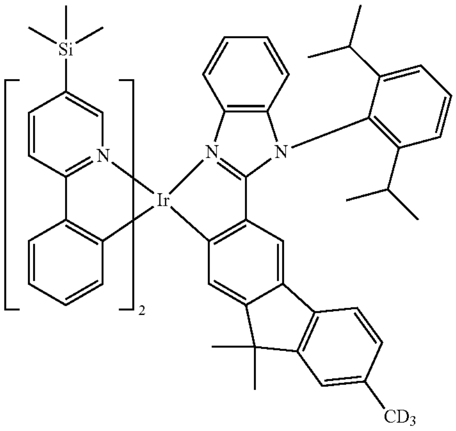
1587
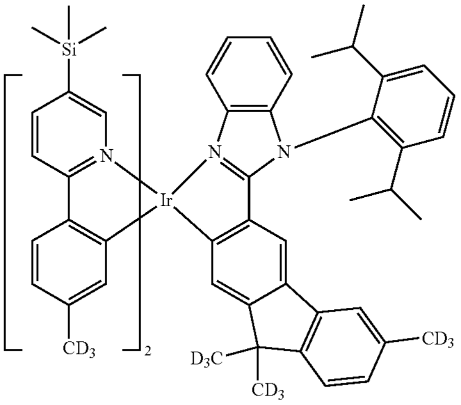
1588
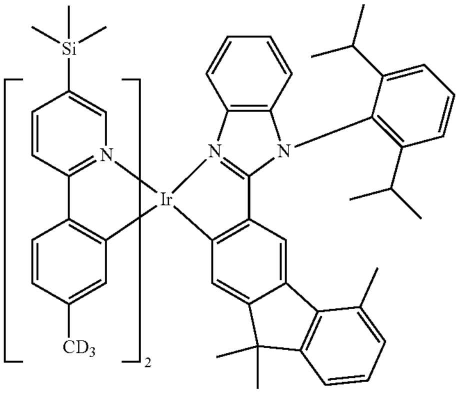

-continued
1589
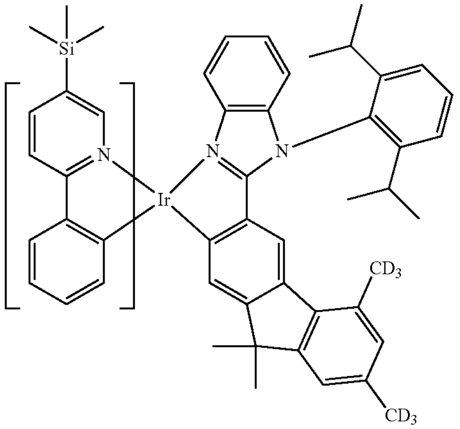
1590
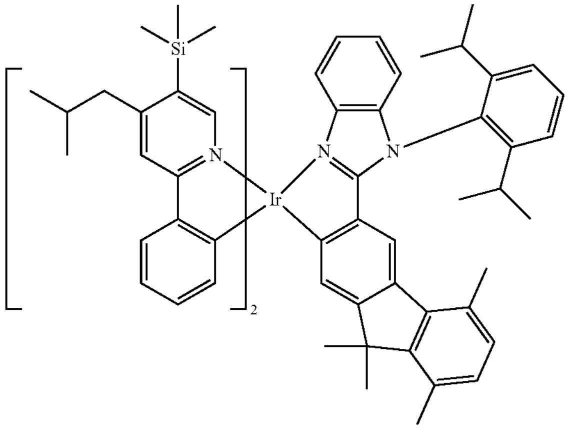
1591
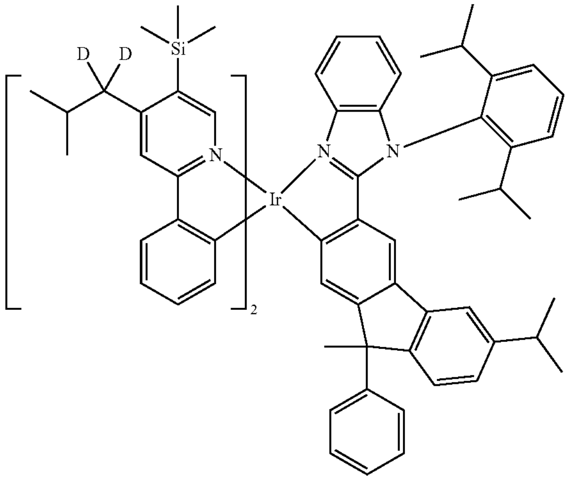
-continued
1592
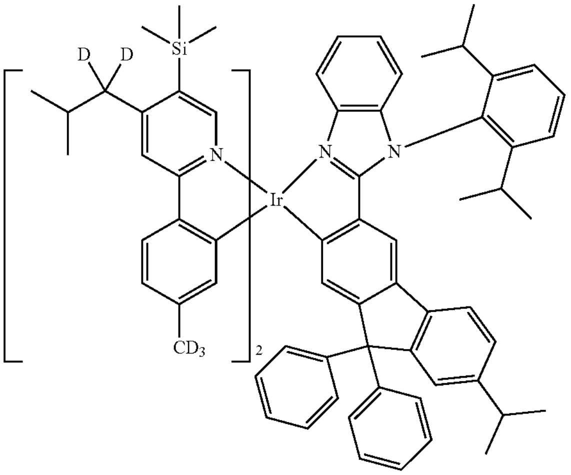
1593
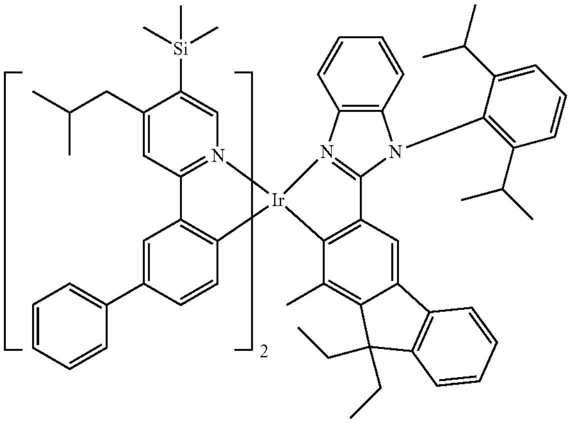
1594
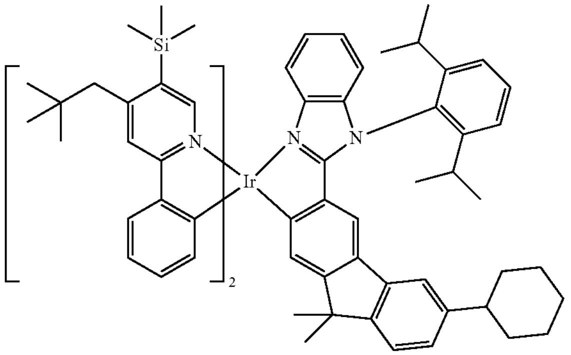

-continued
1595
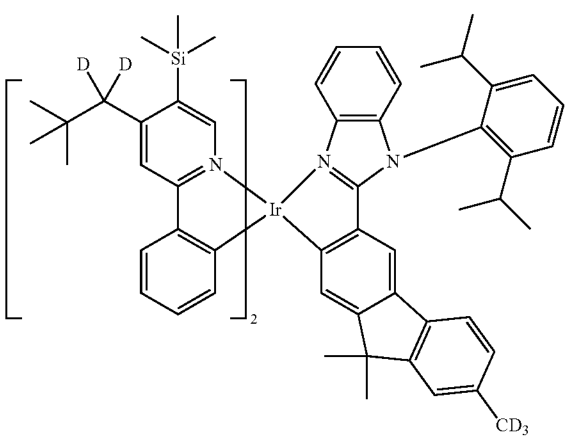
1596
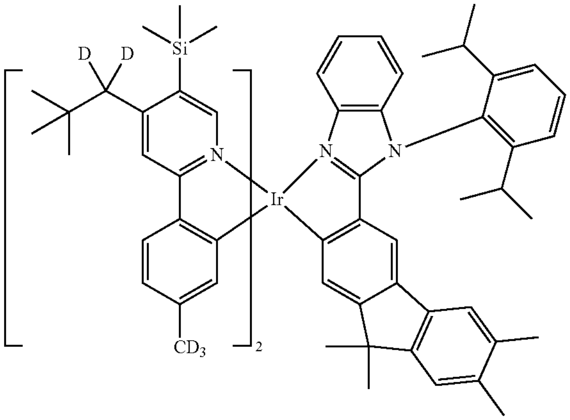
1597
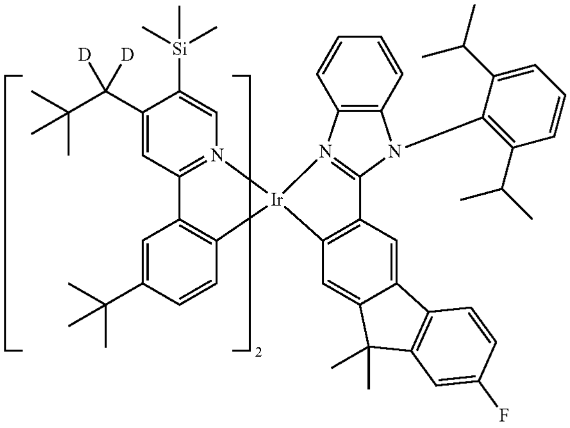
-continued
1598
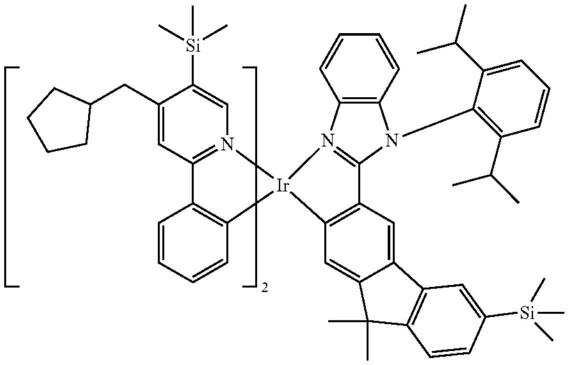
1599
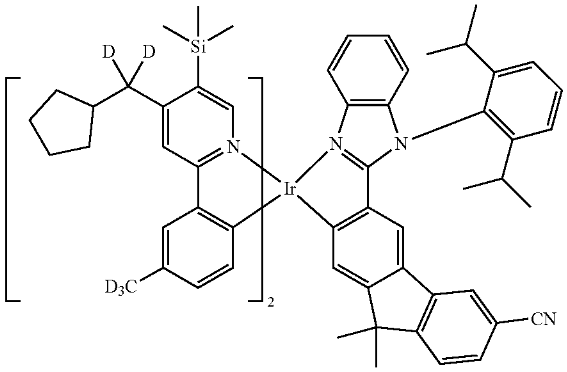
1600
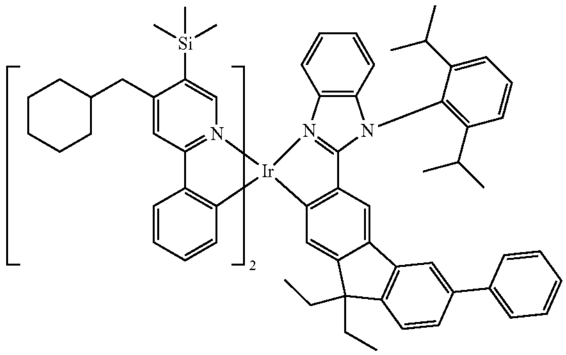
1601
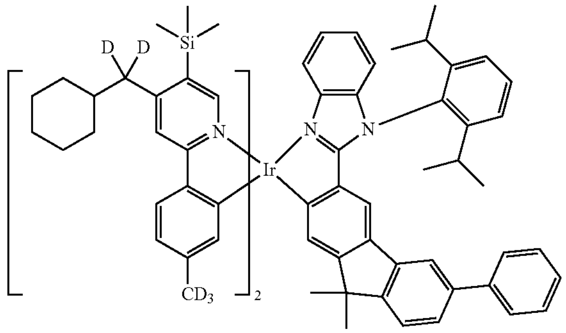

-continued
1602
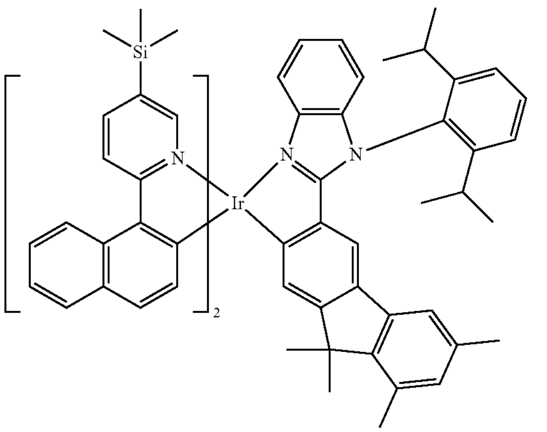
1603
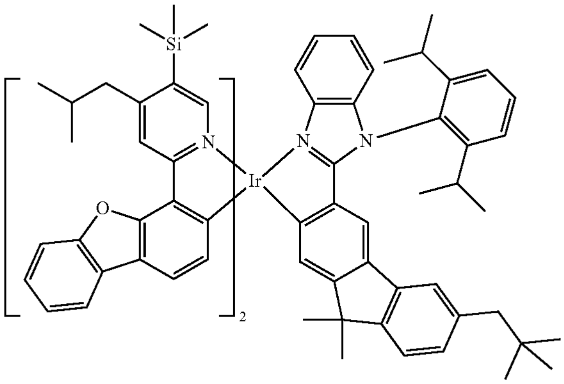
1604
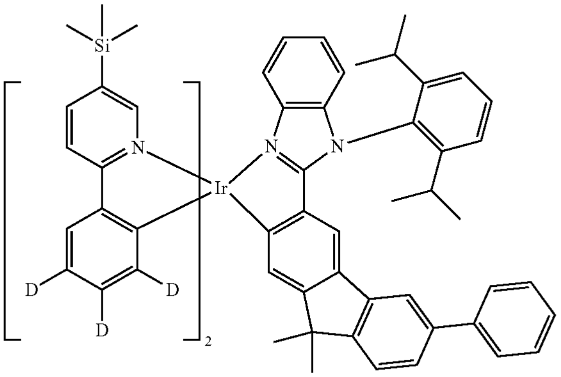
-continued
1605
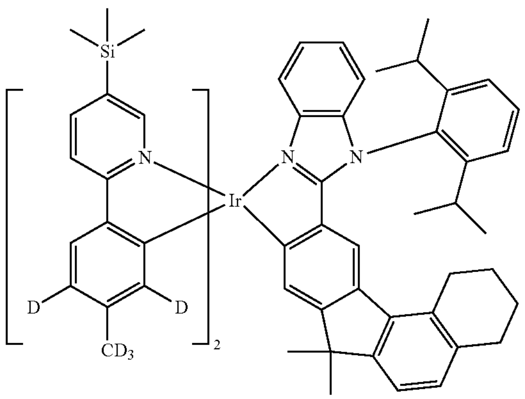
1606
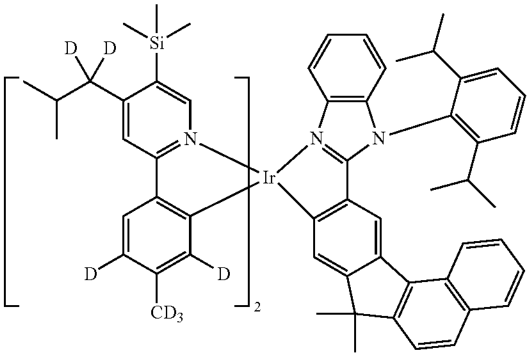
1607
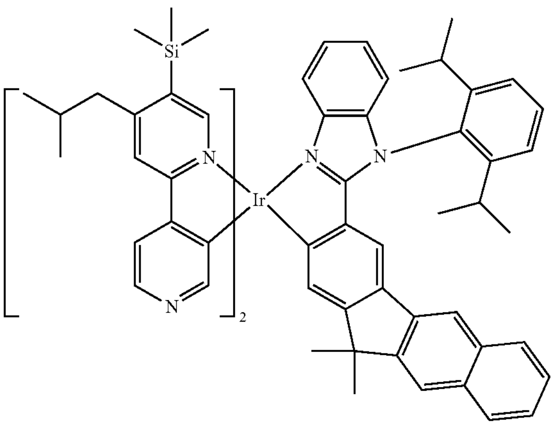

-continued
1608
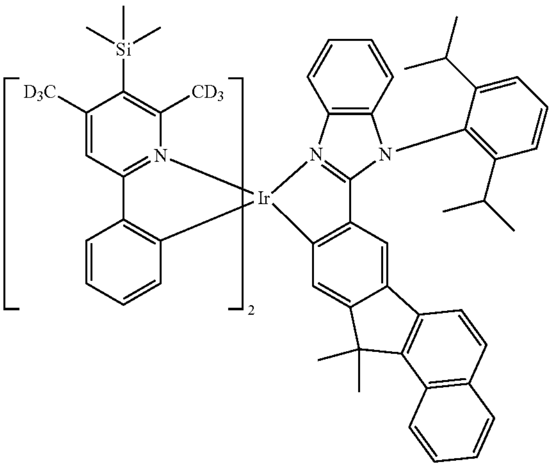
1609
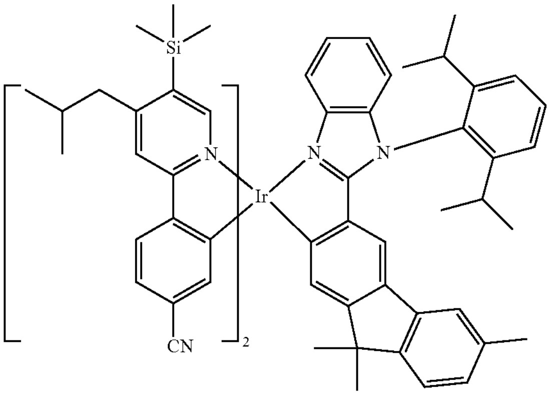
1610
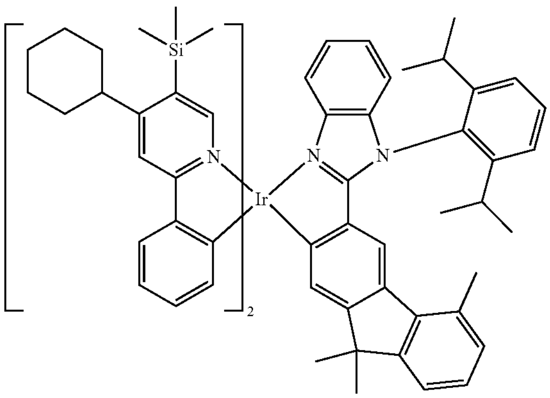
-continued
1611
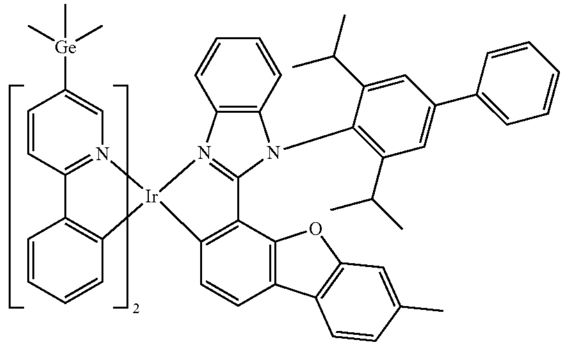
1612
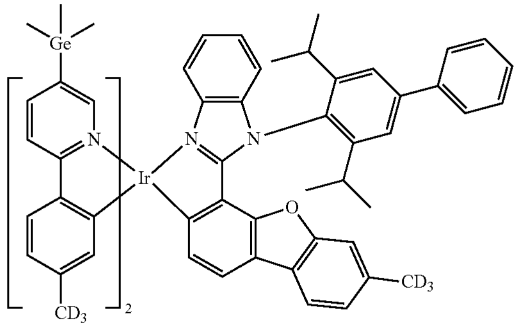
1613
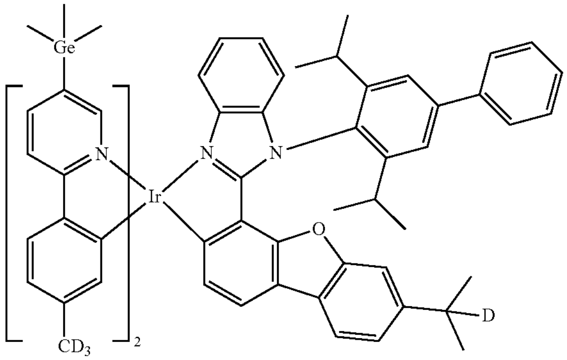
1614
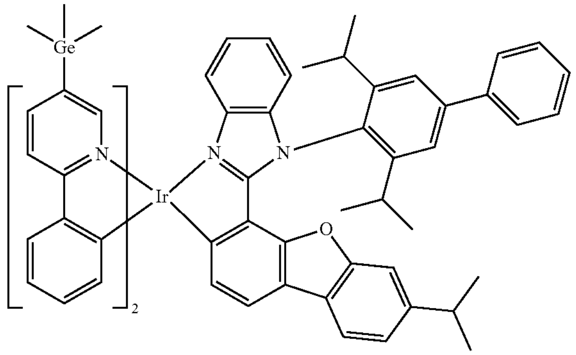

-continued
1615
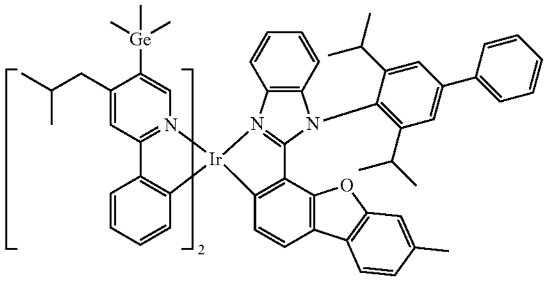
1616
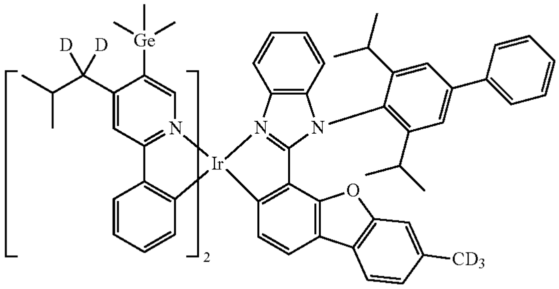
1617
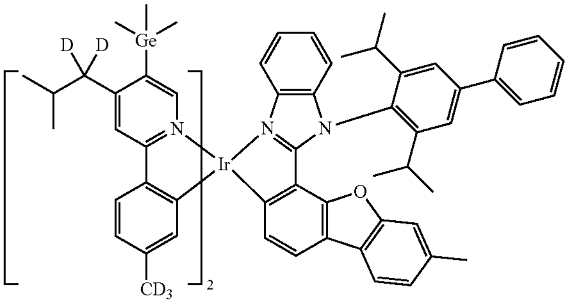
1618
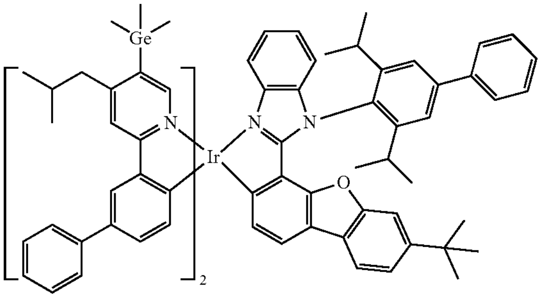
1619
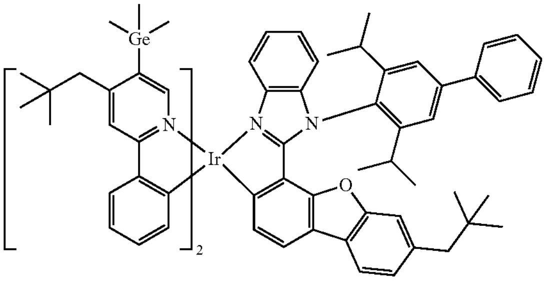
-continued
1620
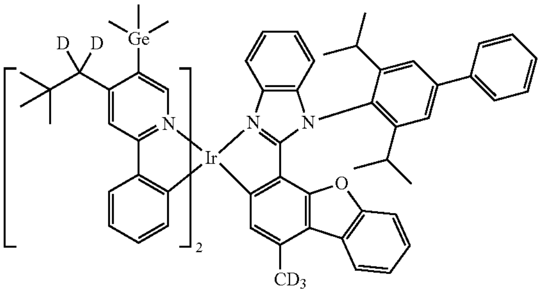
1621
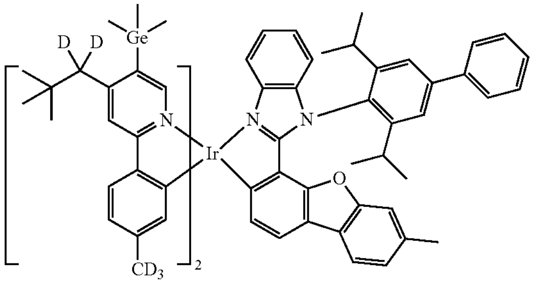
1622
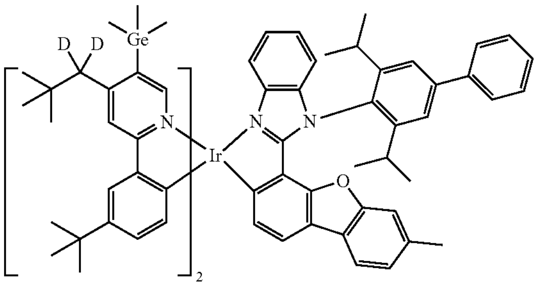
1623
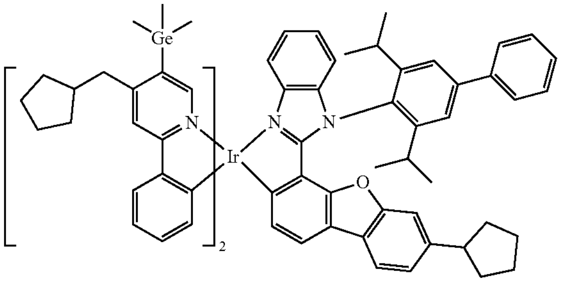
1624
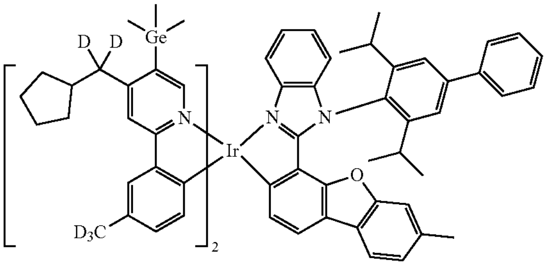

-continued
1625
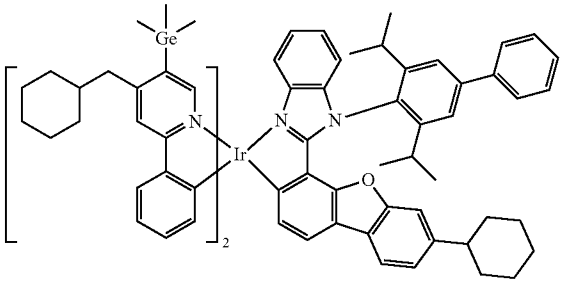
1626
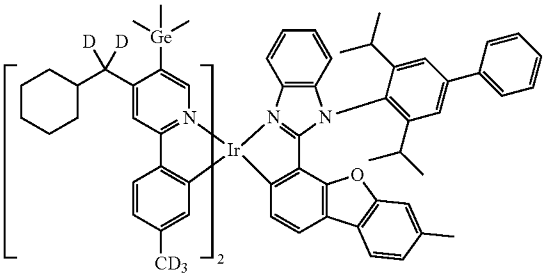
1627
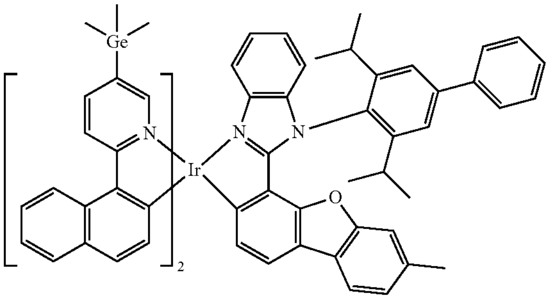
1628
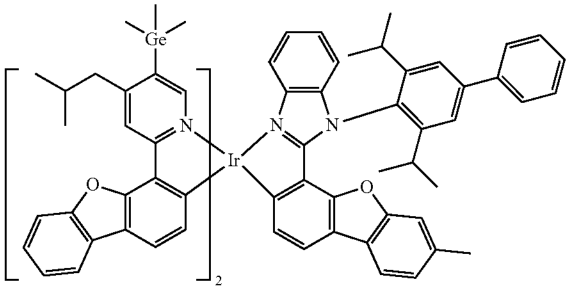
1629
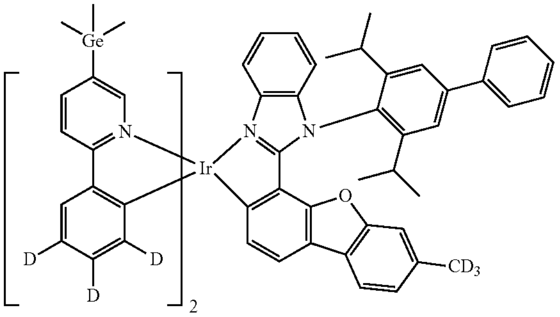
-continued
1630
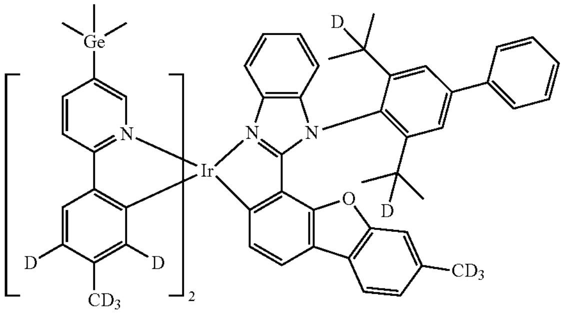
1631
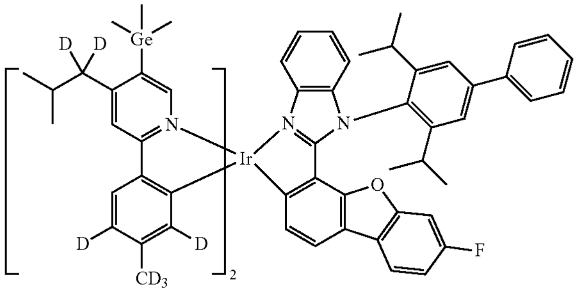
1632
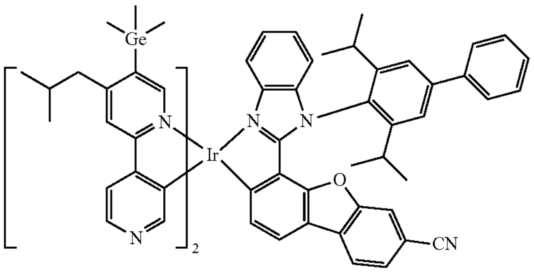
1633
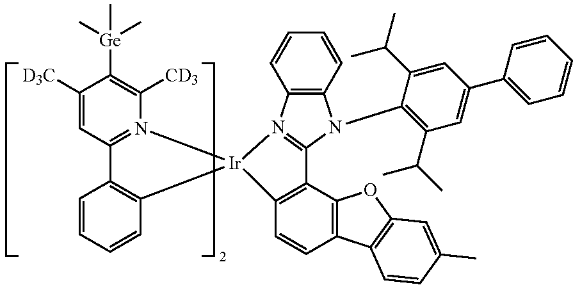
1634
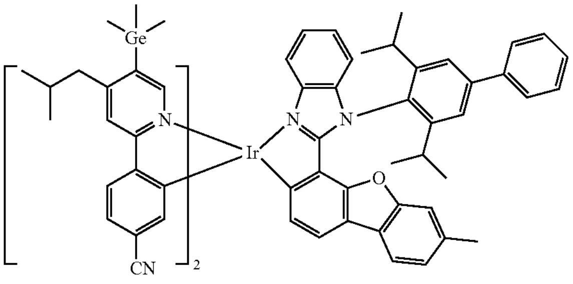

-continued
1635
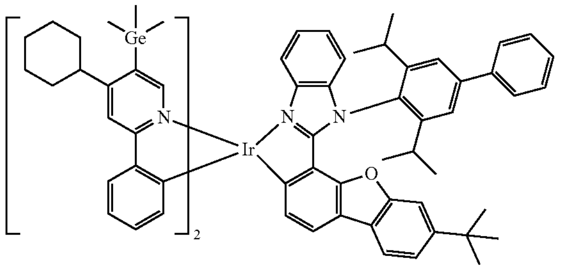
1636
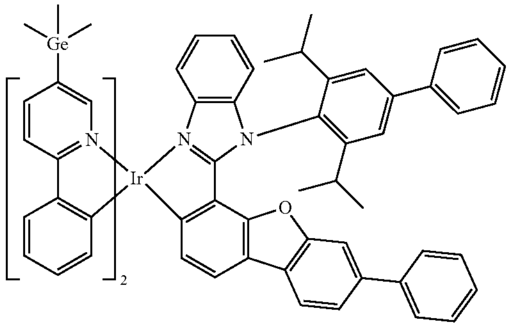
1637
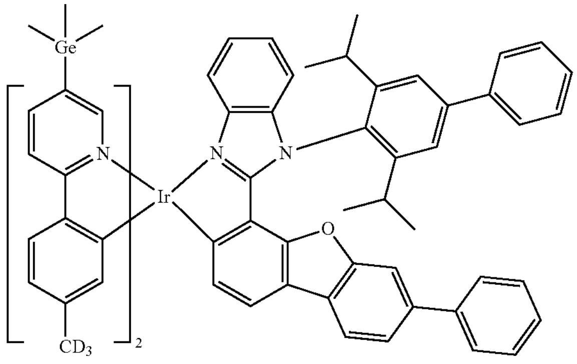
1638
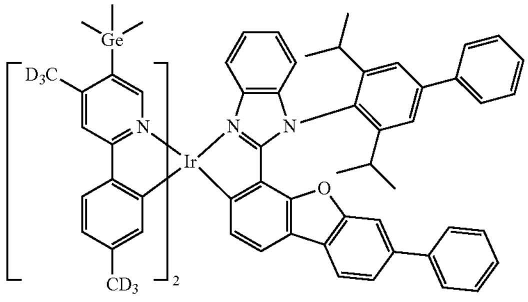
-continued
1639
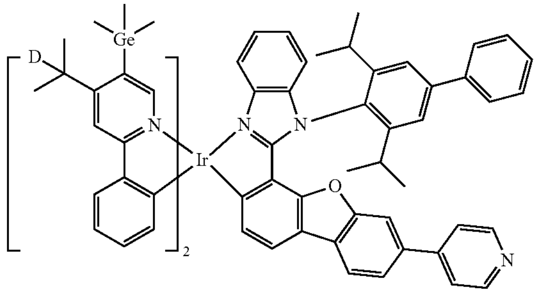
1640
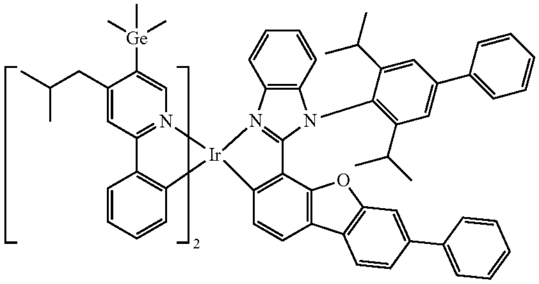
1641
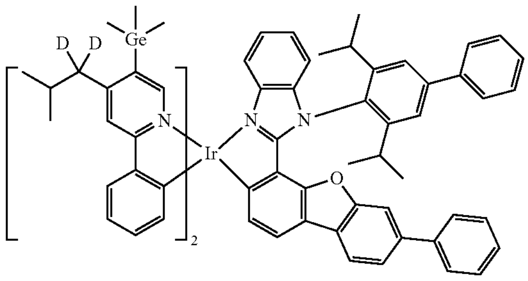
1642
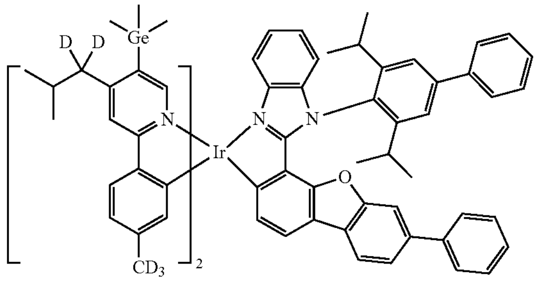
1643
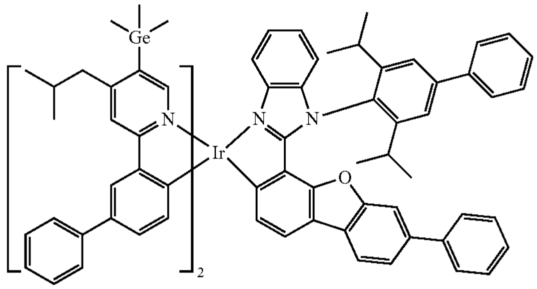

-continued
1644
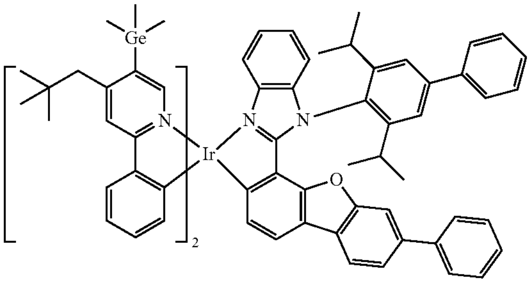
1645
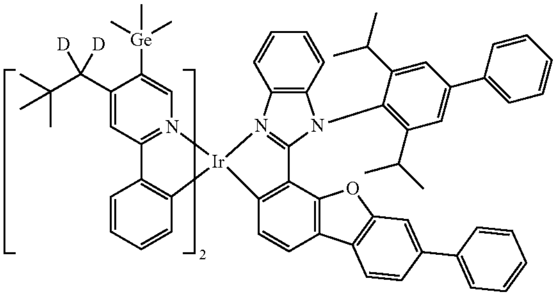
1646
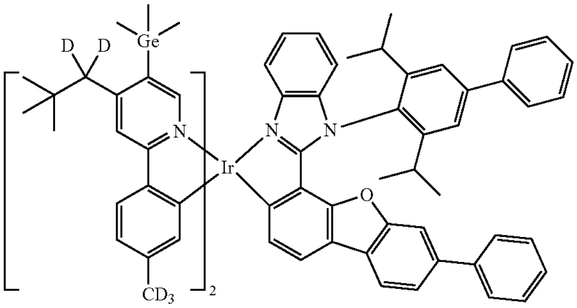
1647
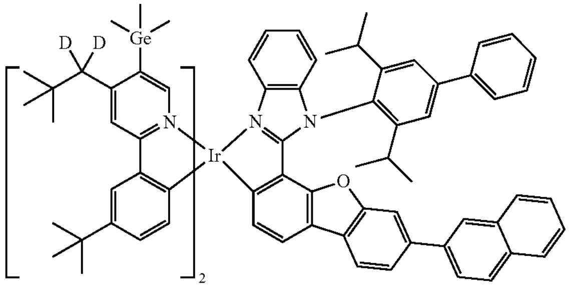
1648
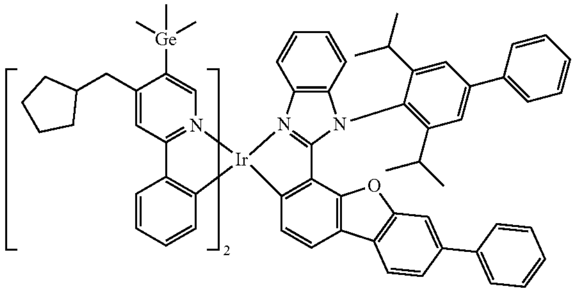
-continued
1649
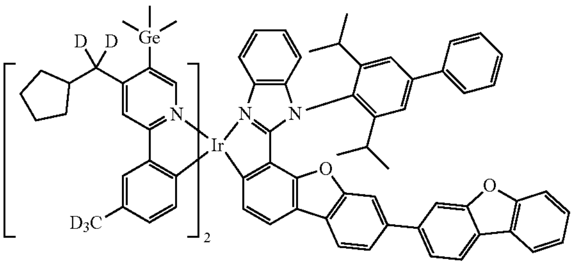
1650
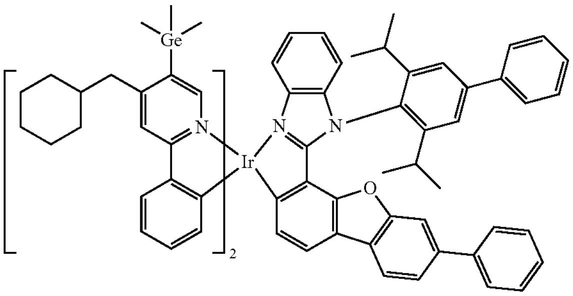
1651
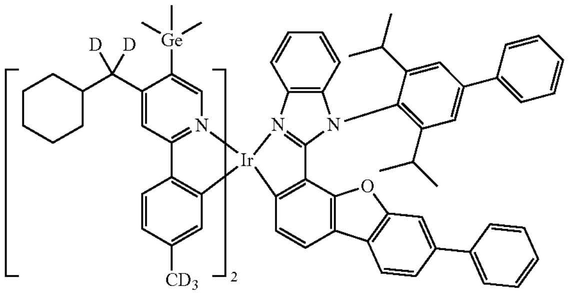
1652
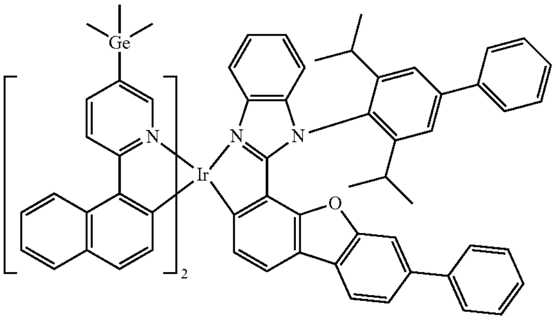
1653
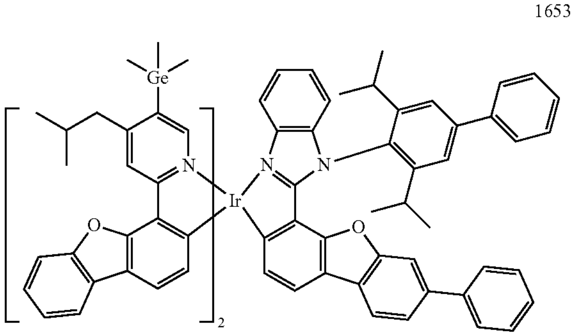

-continued
1654
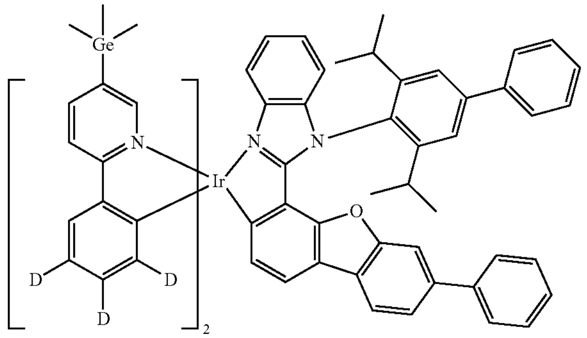
1655
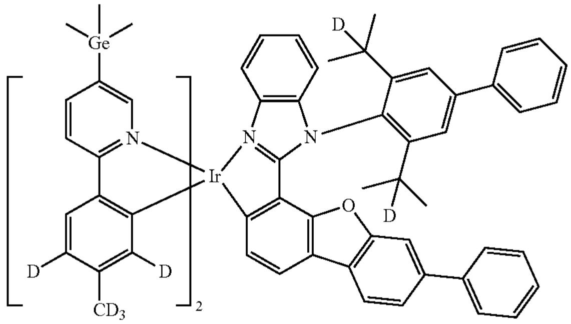
1656
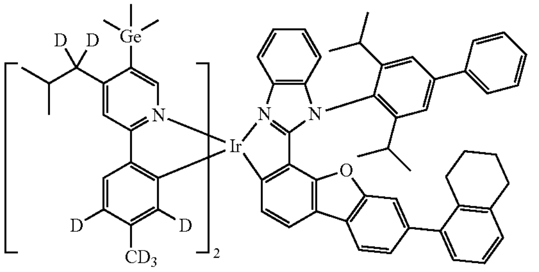
1657
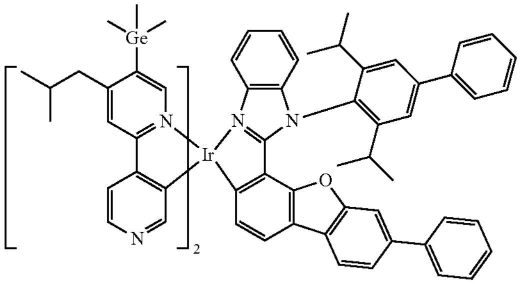
1658
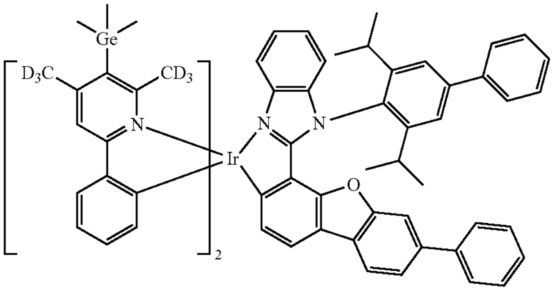
-continued
1659
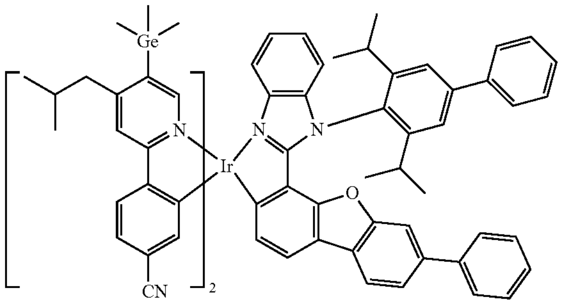
1660
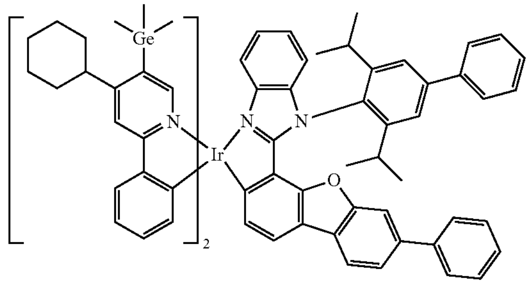
1661
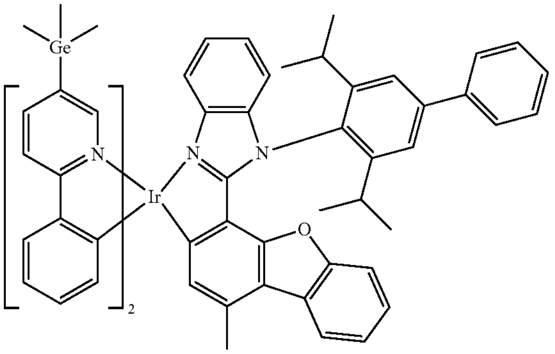
1662
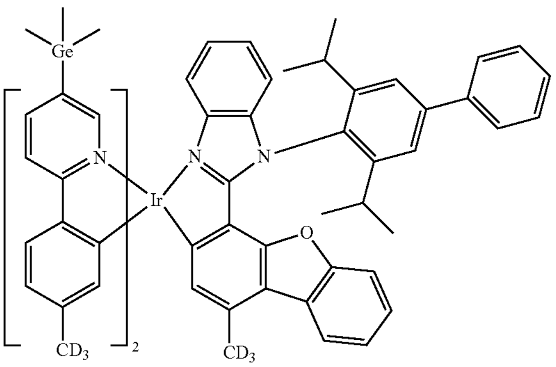

-continued
1663
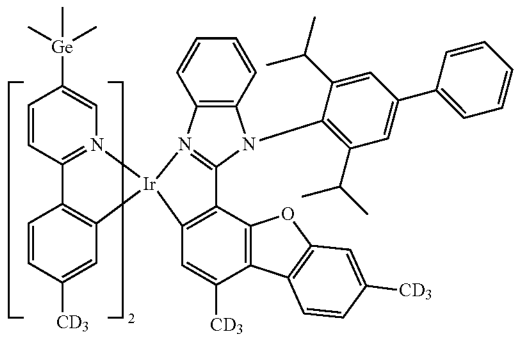
1664
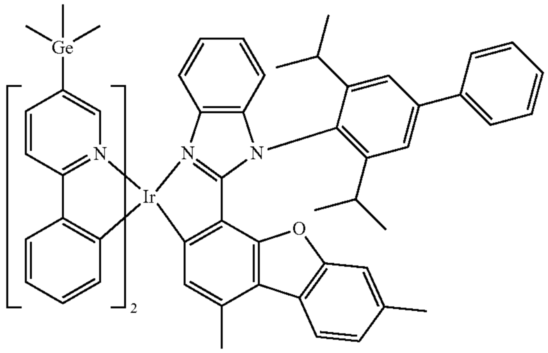
1665
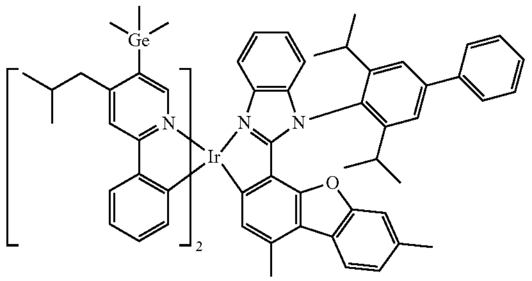
1666
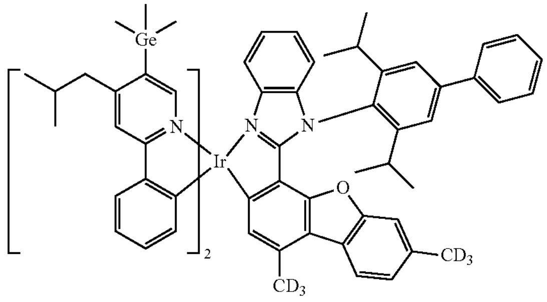
-continued
1667
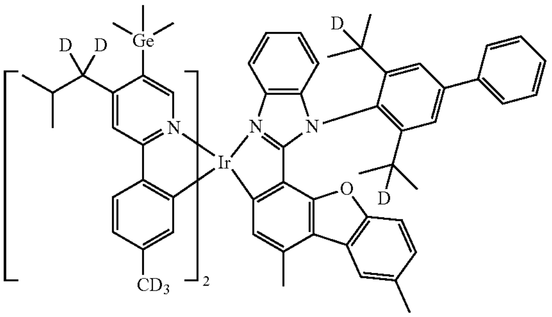
1668
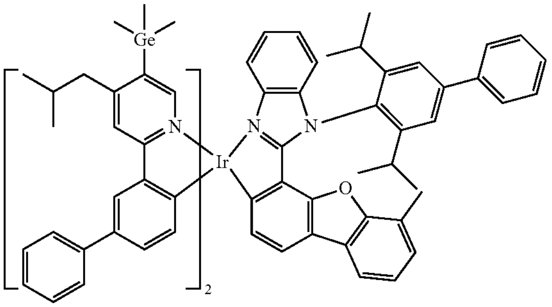
1669
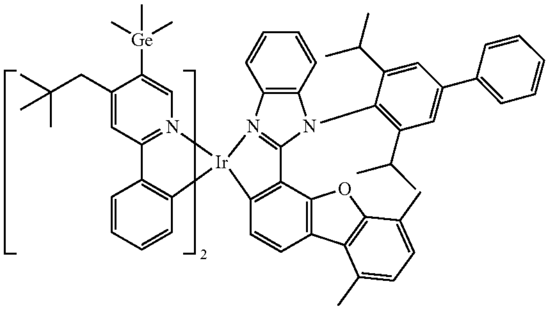
1670
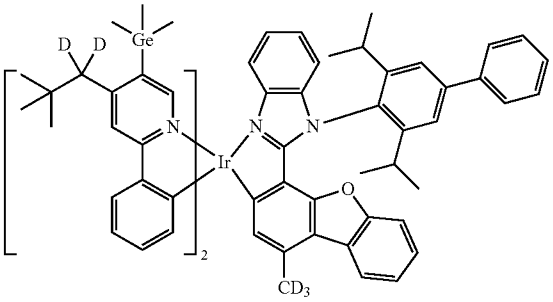

-continued
1671
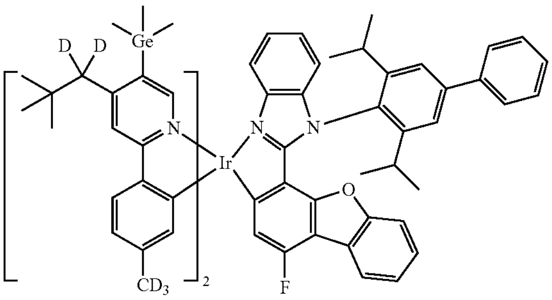
1672
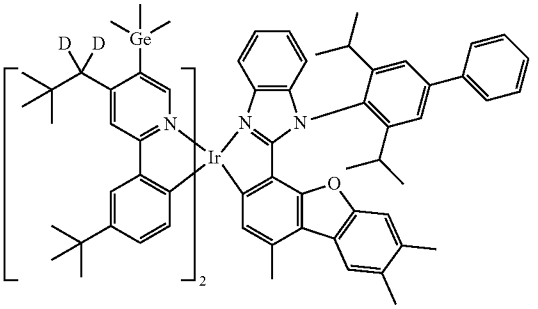
1673
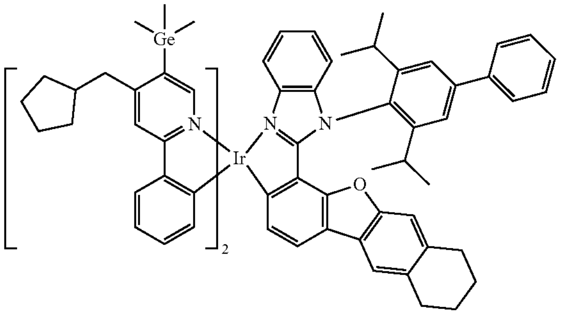
1674
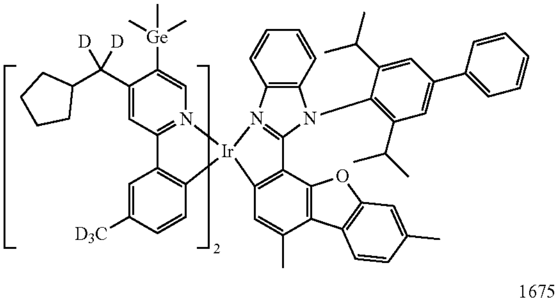
1675
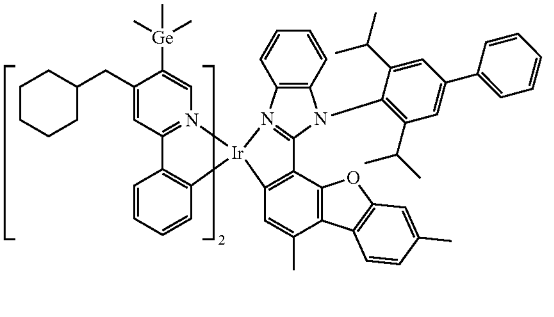
-continued
1676
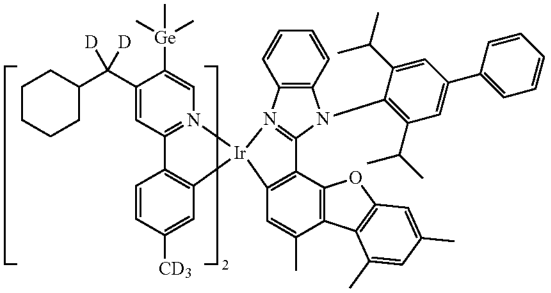
1677
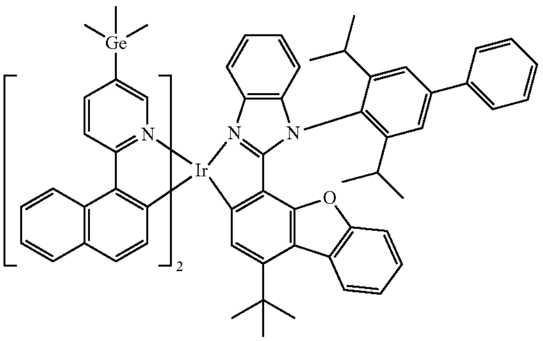
1678
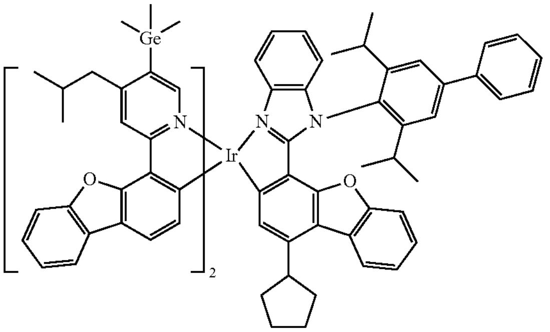
1679
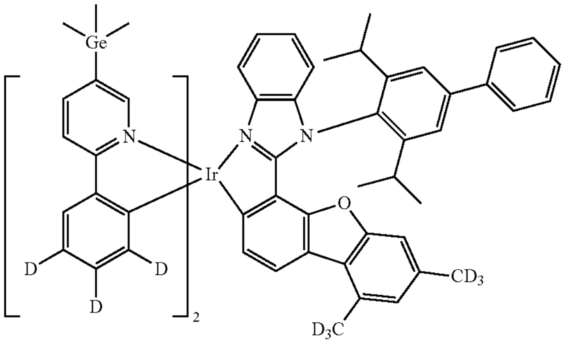

-continued
1680
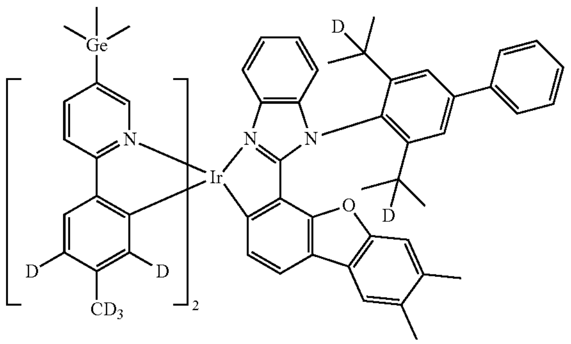
1681
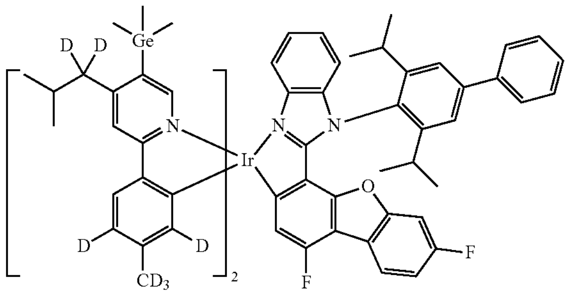
1682
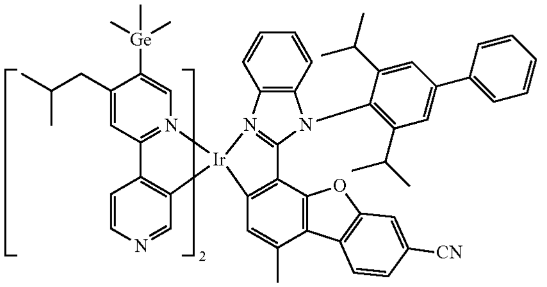
1683
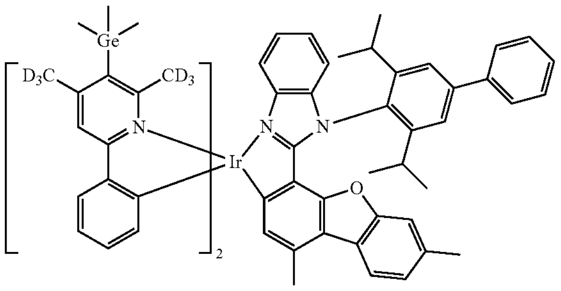
1684
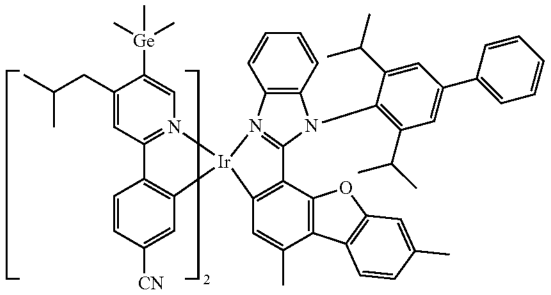
-continued
1685
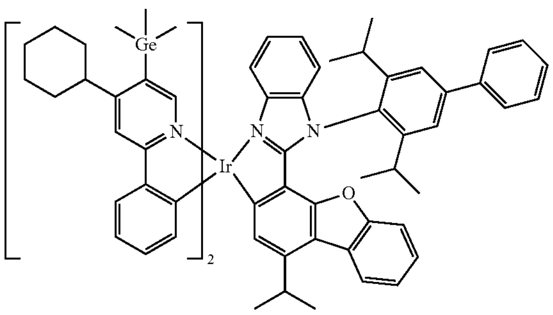
1686
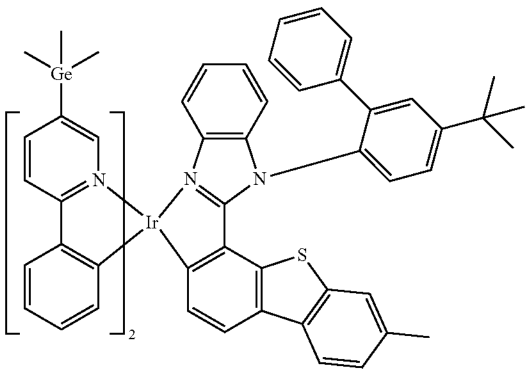
1687
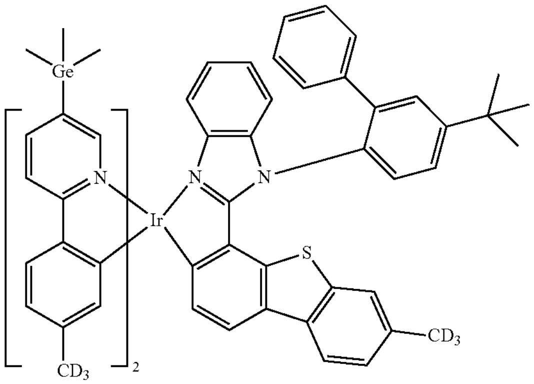
1688
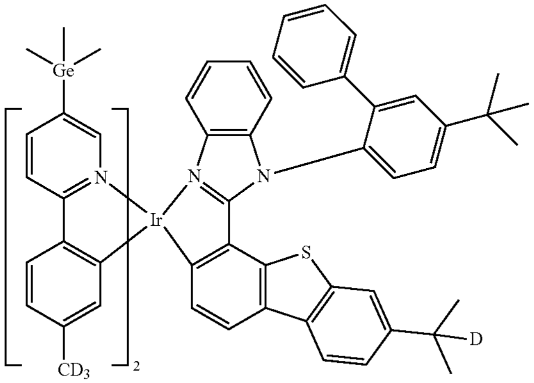

-continued
1689
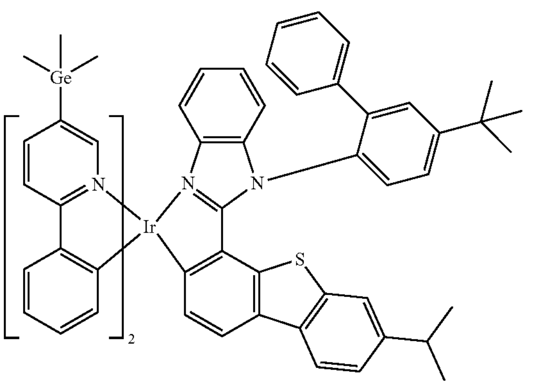
1690
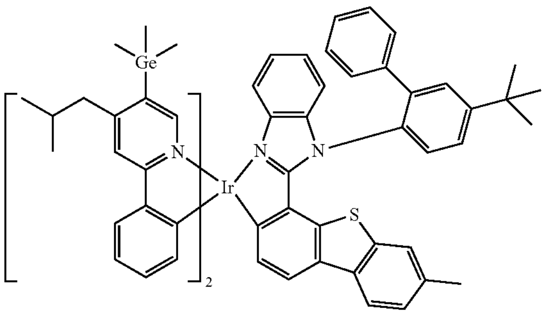
1691
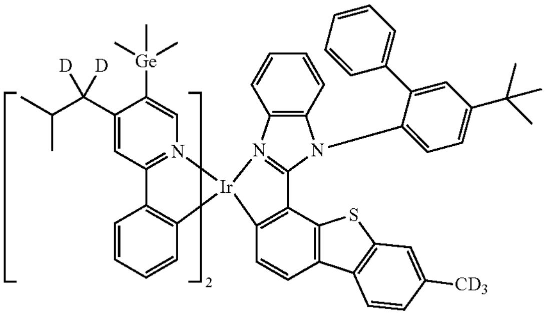
1692
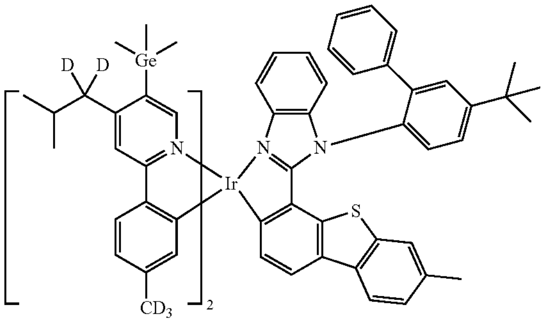
-continued
1693
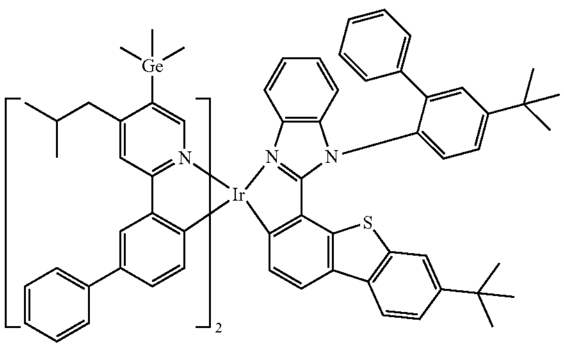
1694
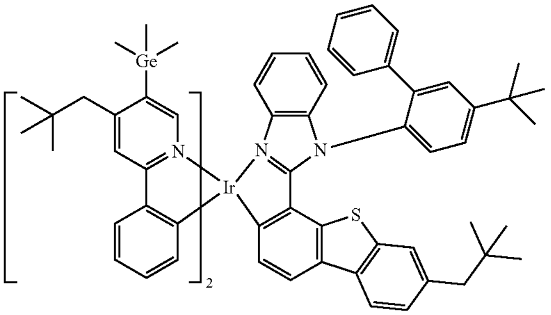
1695
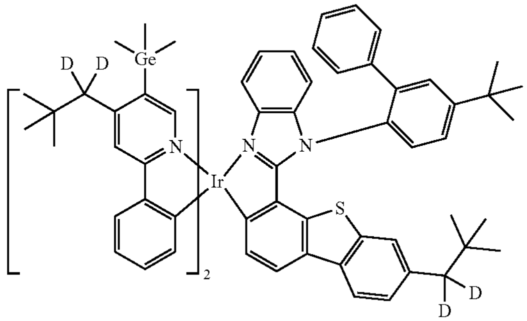
1696
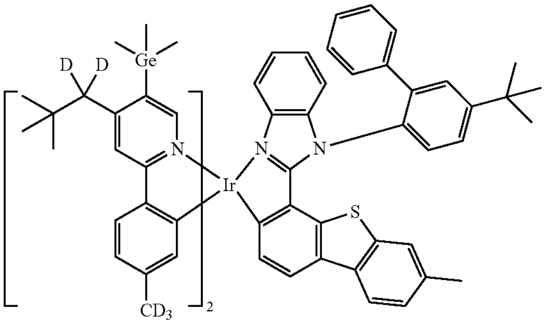

-continued
1697
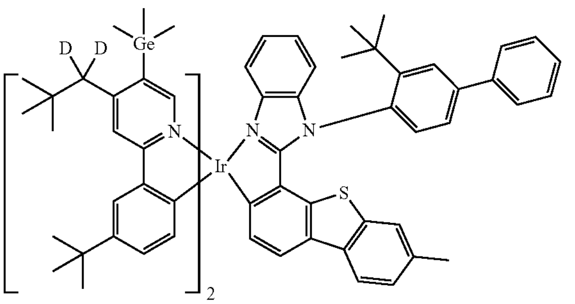
1698
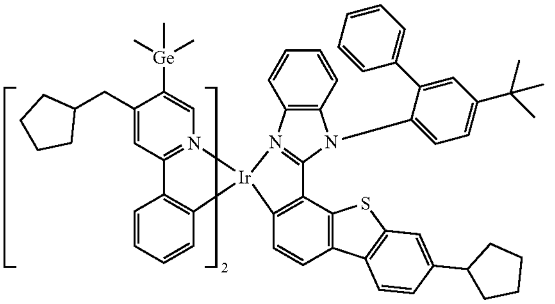
1699
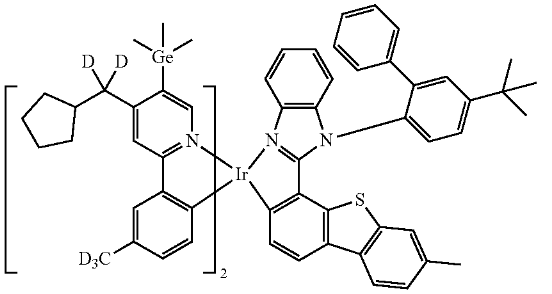
1700
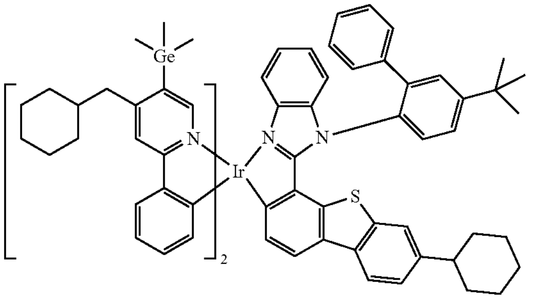
1701
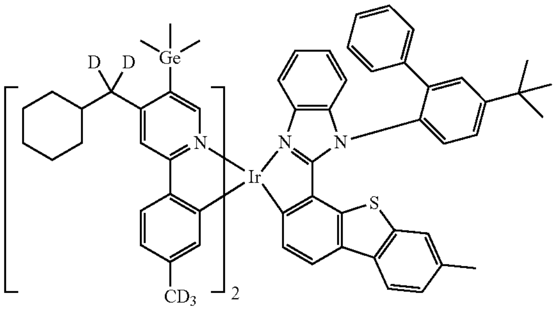
1702
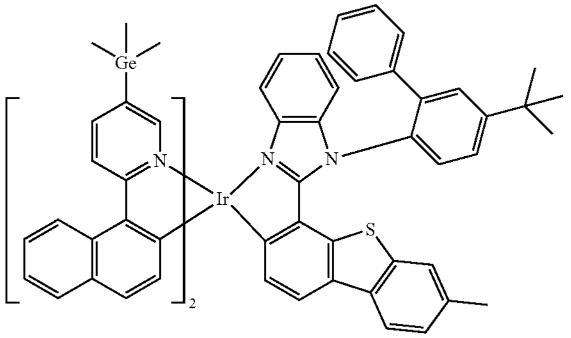
1703
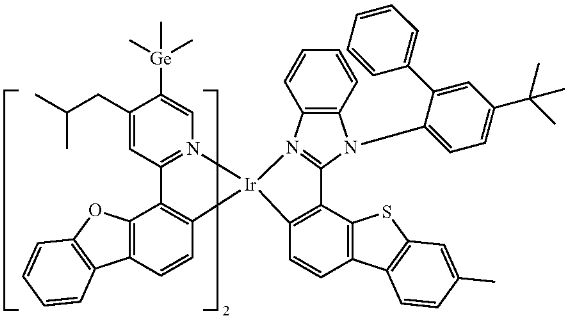
1704
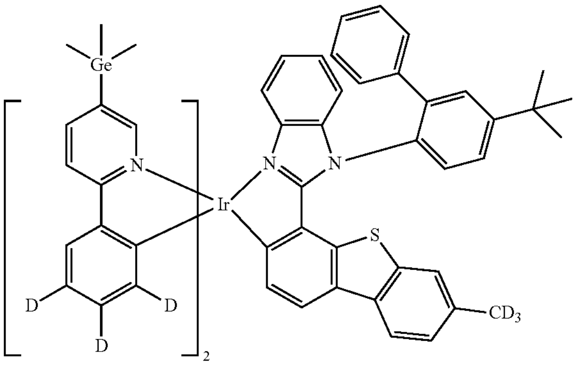
1705
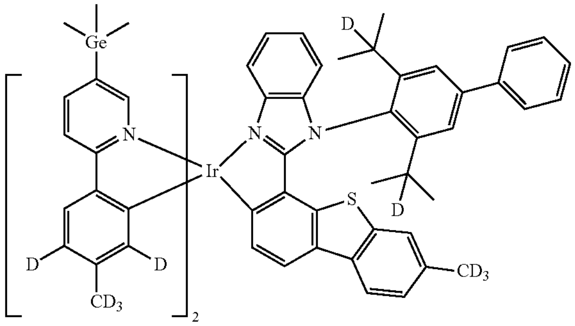

-continued
1706
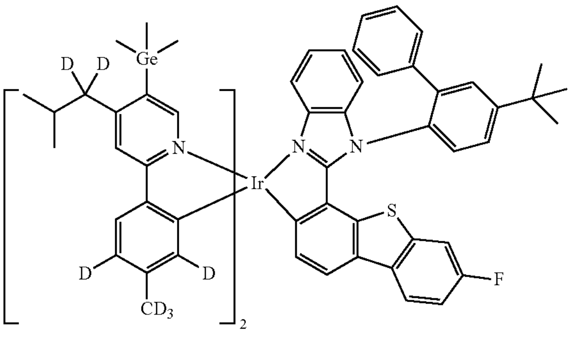
1707
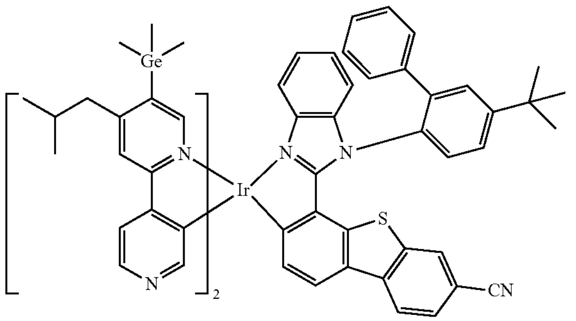
1708
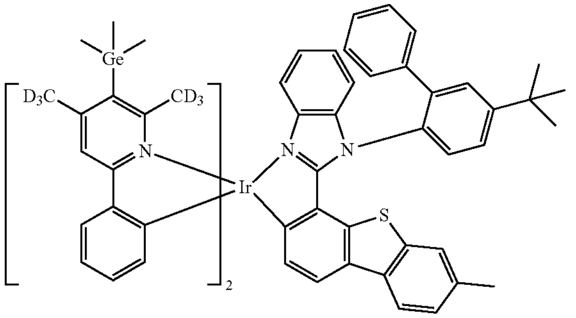
1709
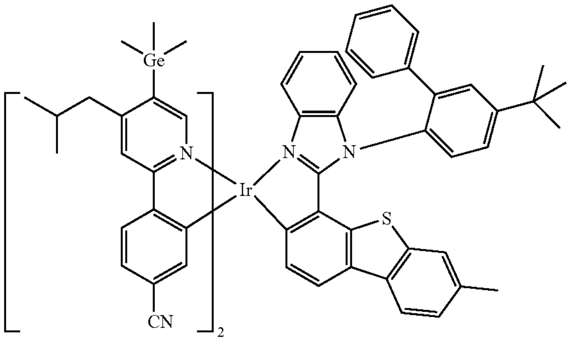
-continued
1710
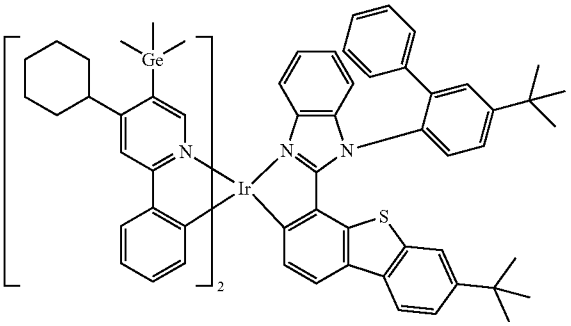
1711
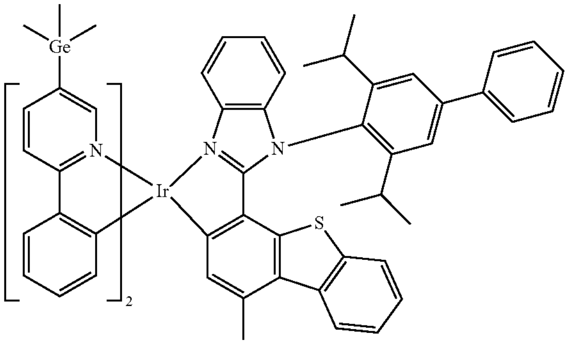
1712
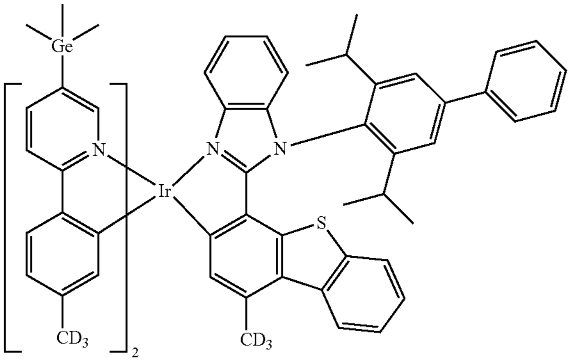
1713
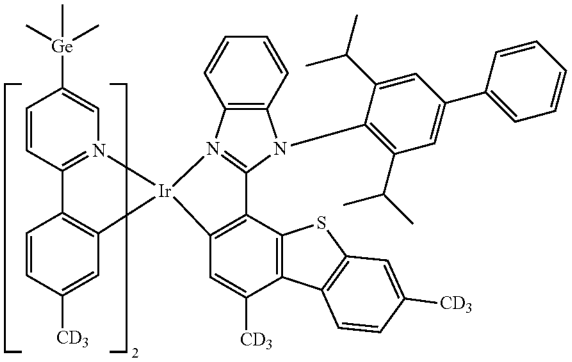

-continued
1714
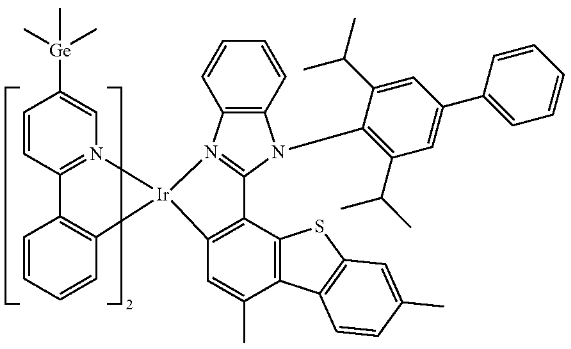
1715
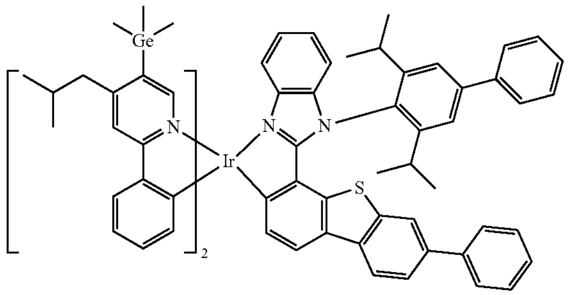
1716
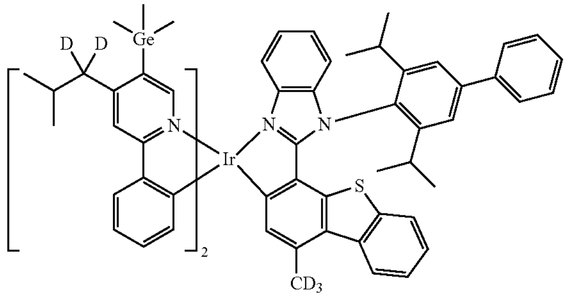
1717
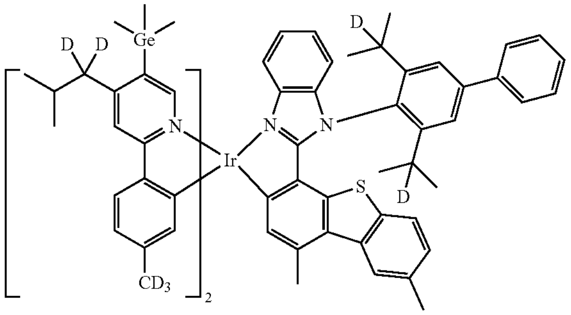
-continued
1718
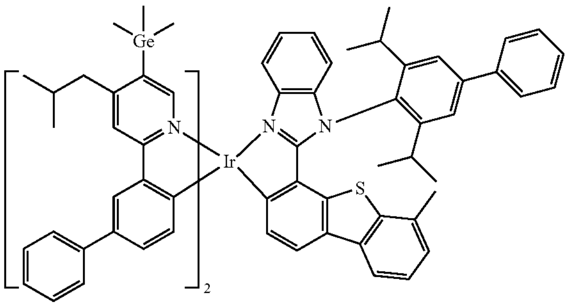
1719
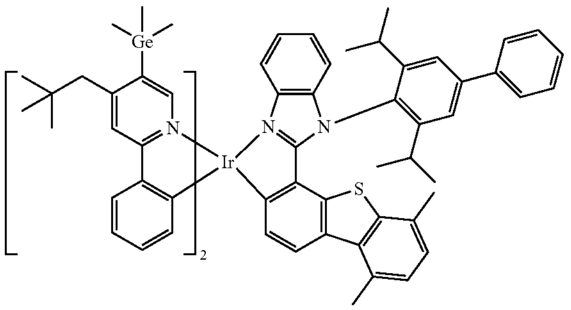
1720
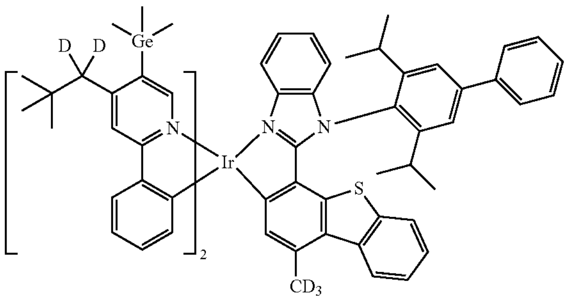
1721
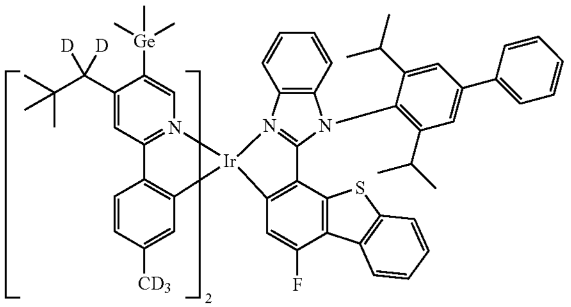

-continued
1722
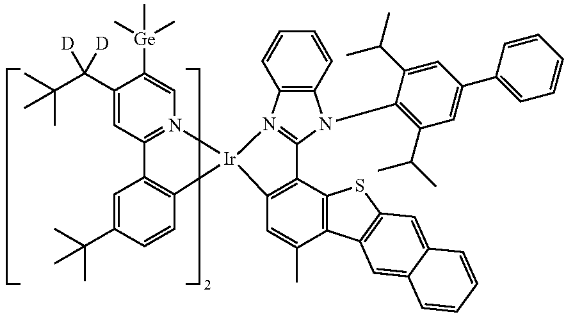
1723
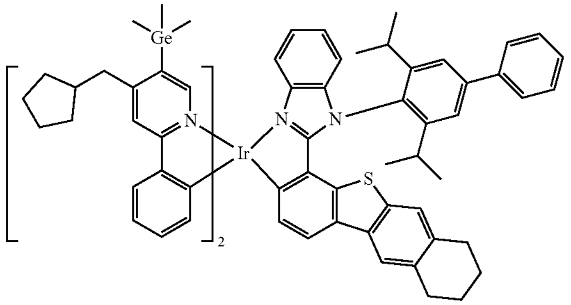
1724
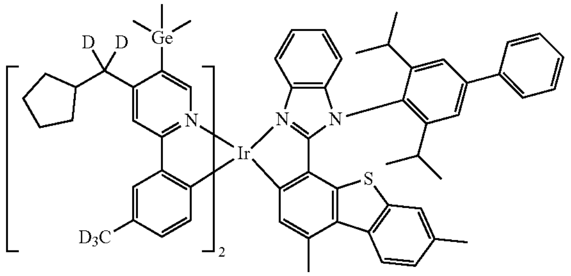
1725
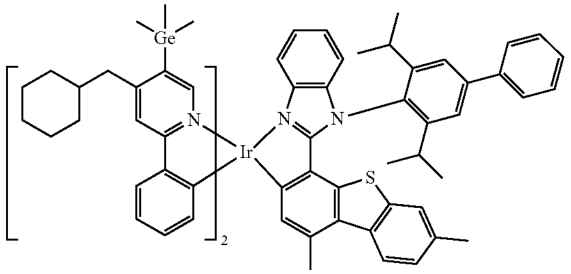
1726
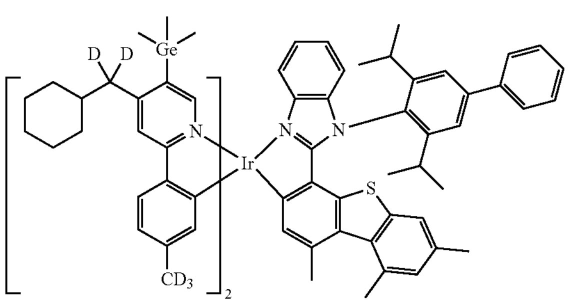
-continued
1727
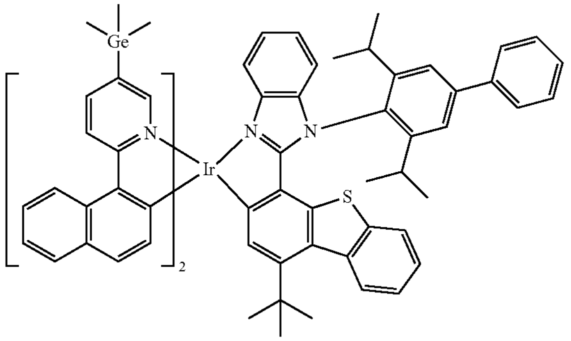
1728
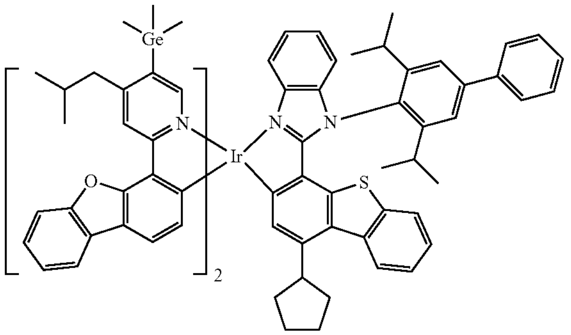
1729
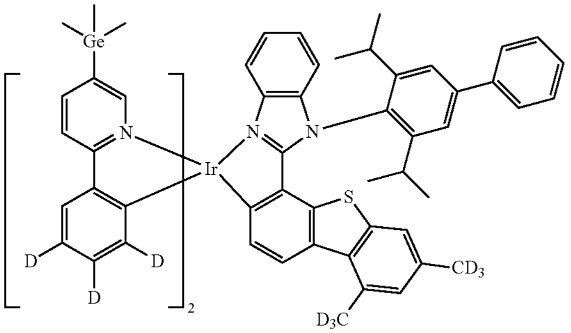
1730
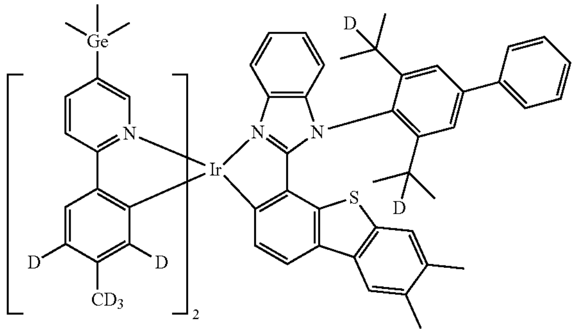

-continued
1731
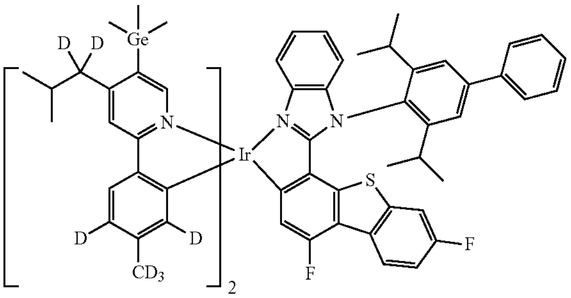
1732
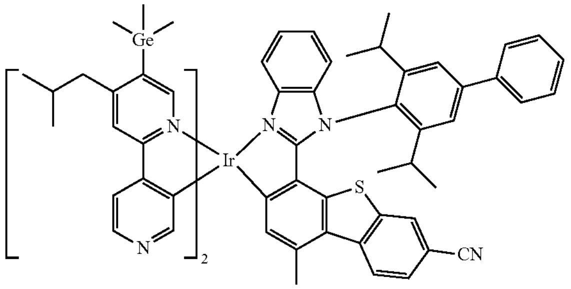
1733
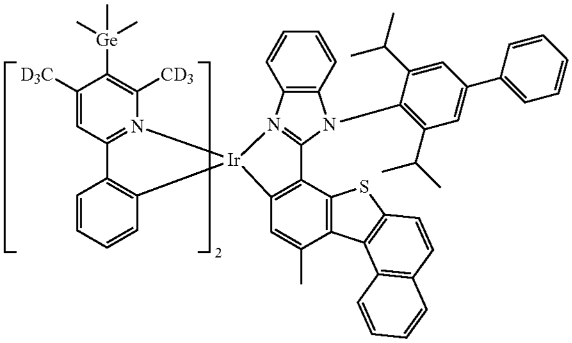
1734
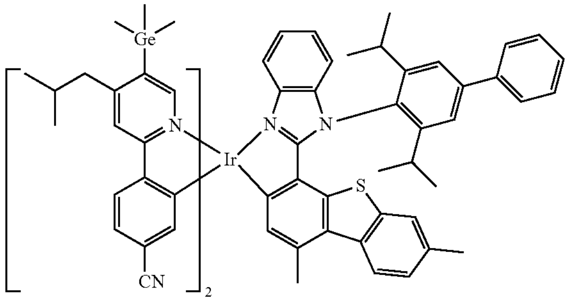
-continued
1735
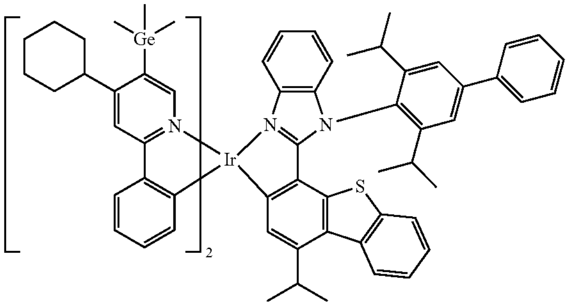
1736
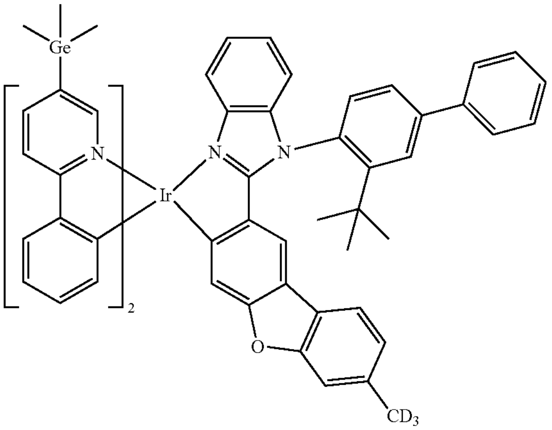
1737
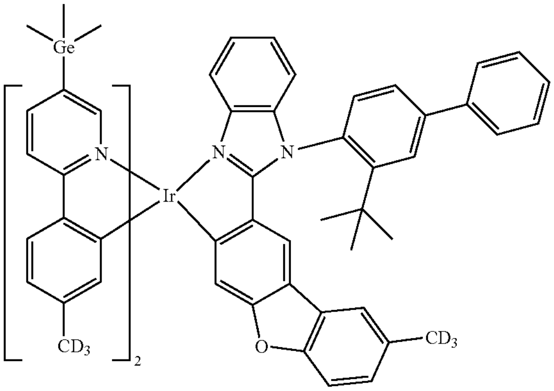
1738
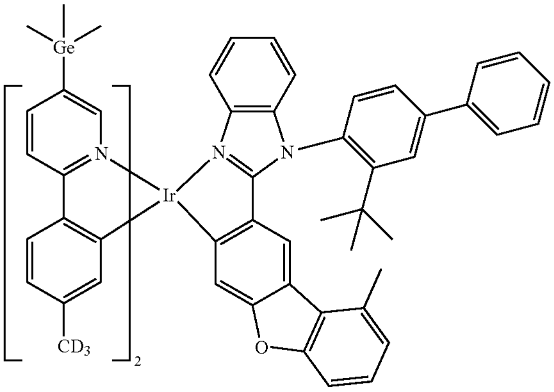

-continued
1739
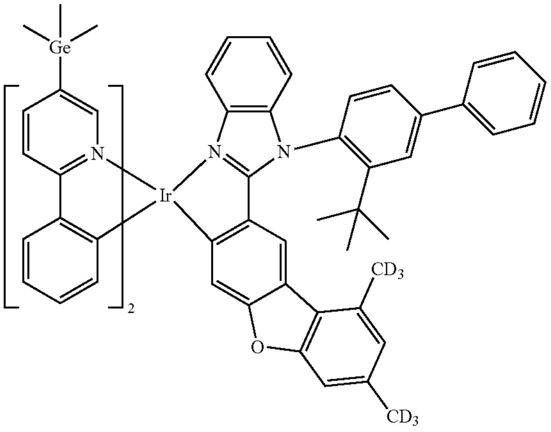
1740
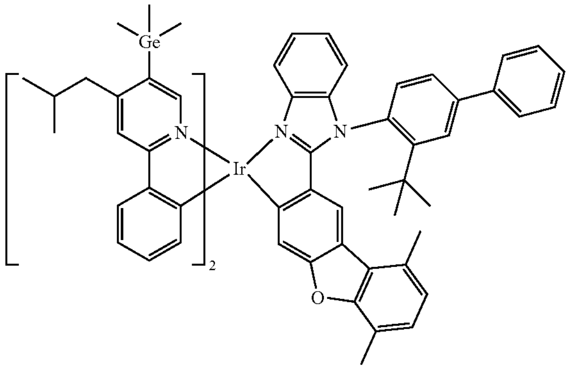
1741
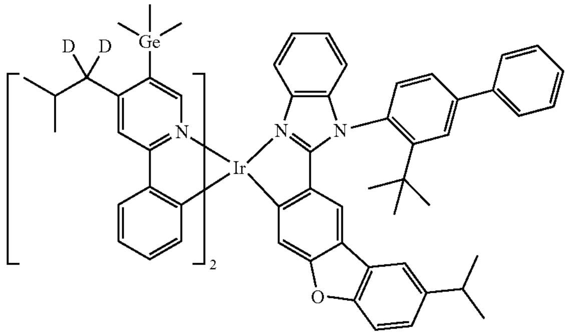
1742
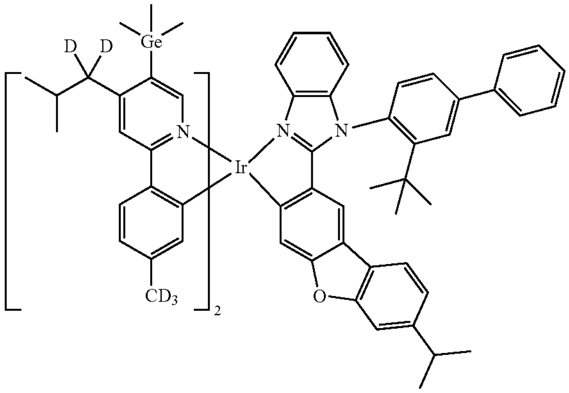
-continued
1743
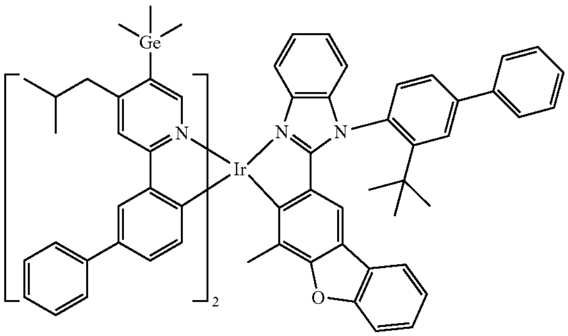
1744
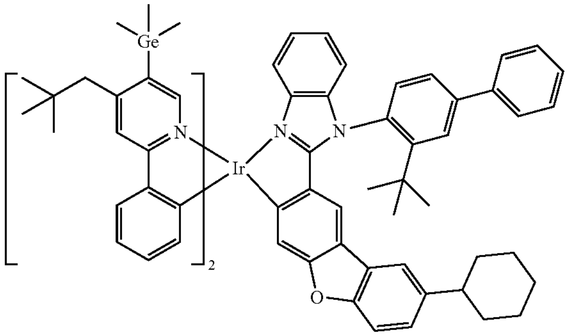
1745
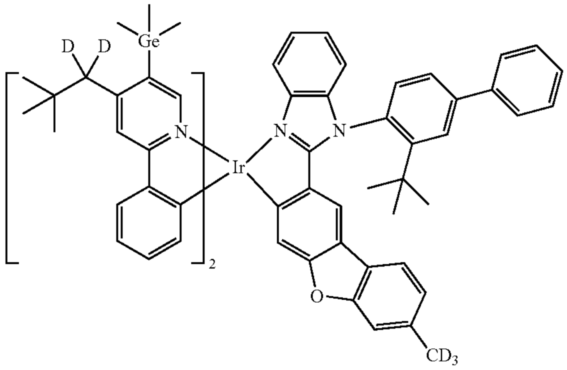
1746
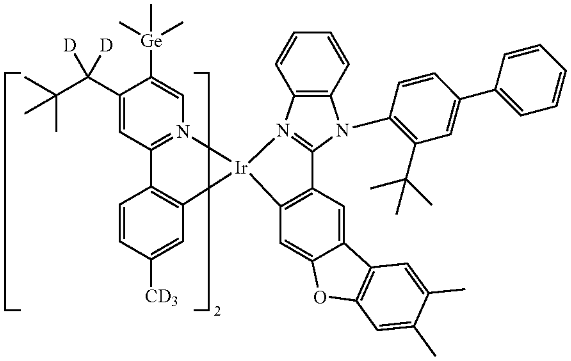

-continued
1747
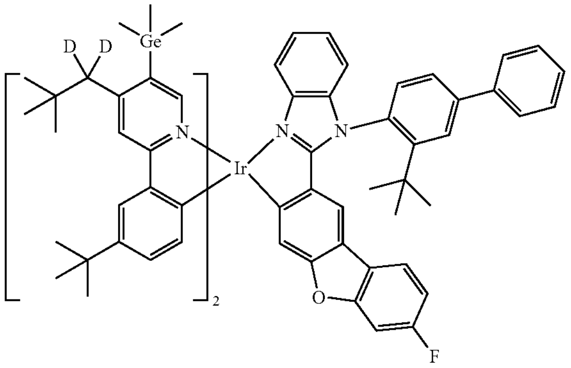
1748
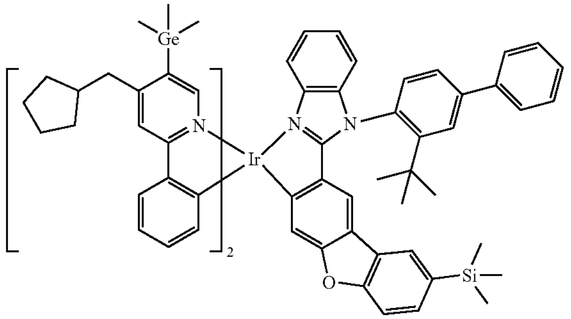
1749
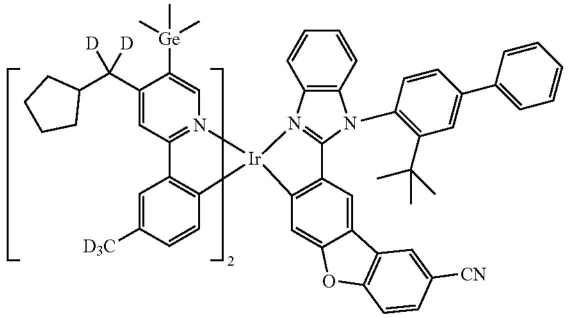
1750
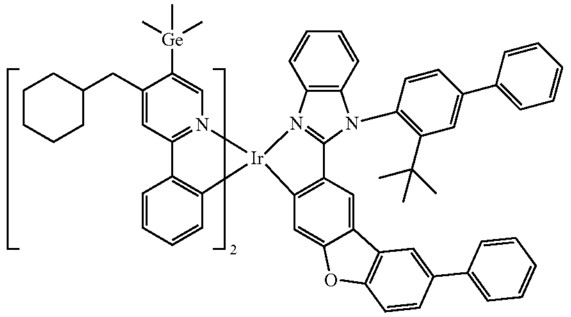
-continued
1751
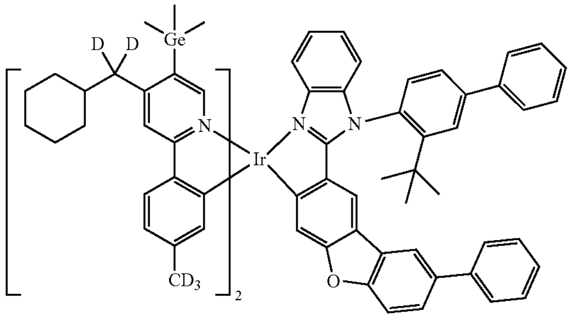
1752
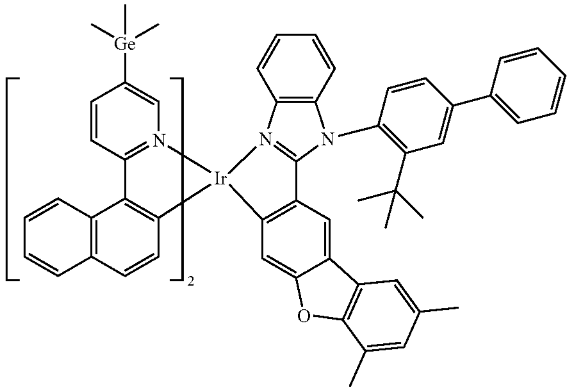
1753
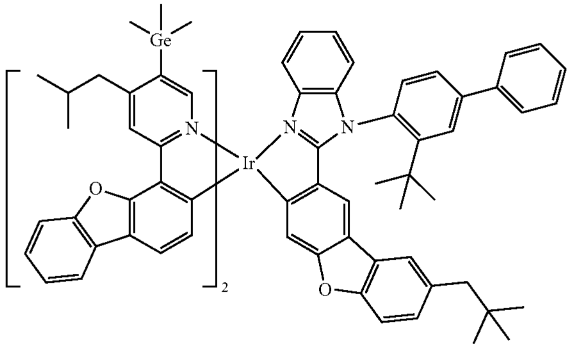
1754
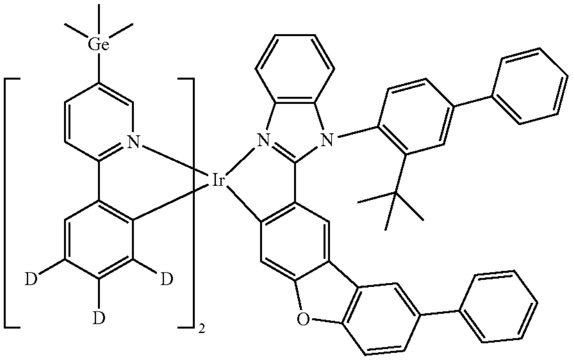

-continued
1755
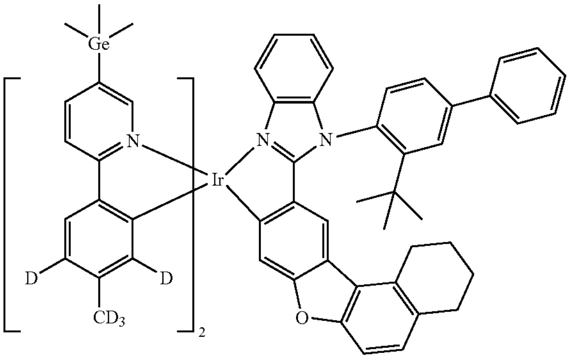
1756
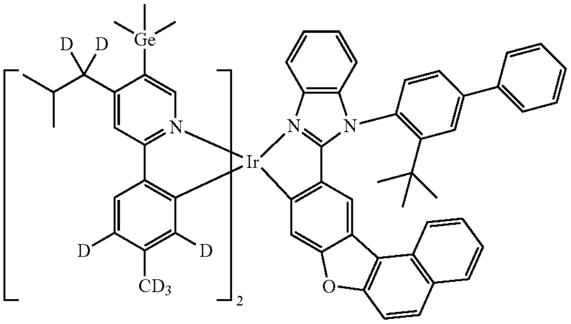
1757
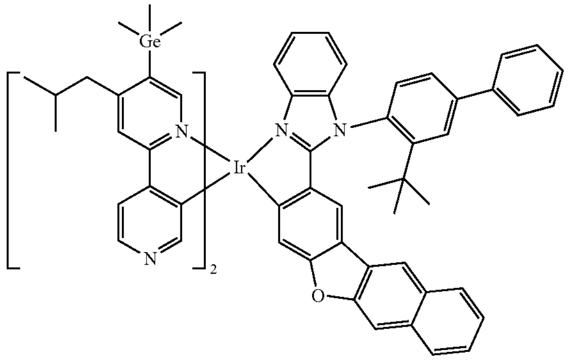
1758
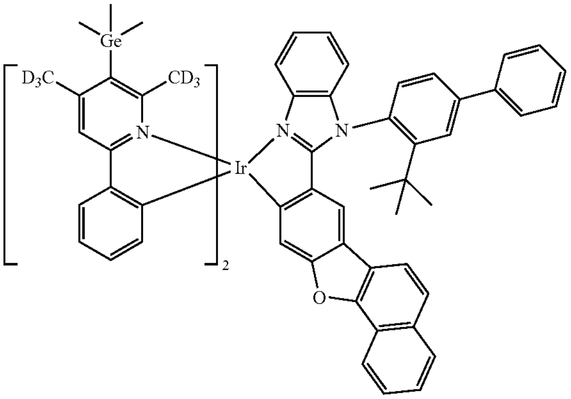
-continued
1759
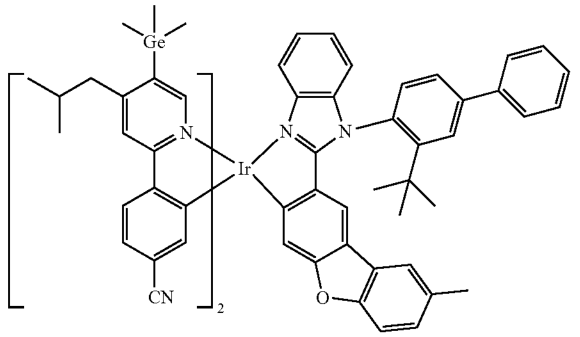
1760
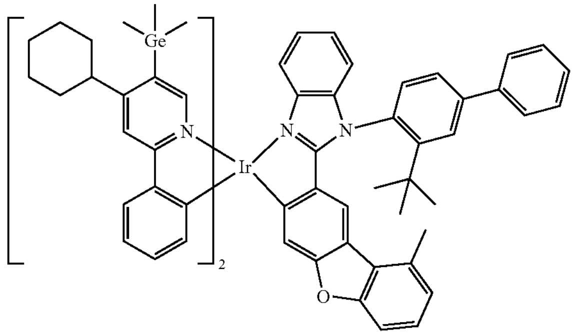
1761
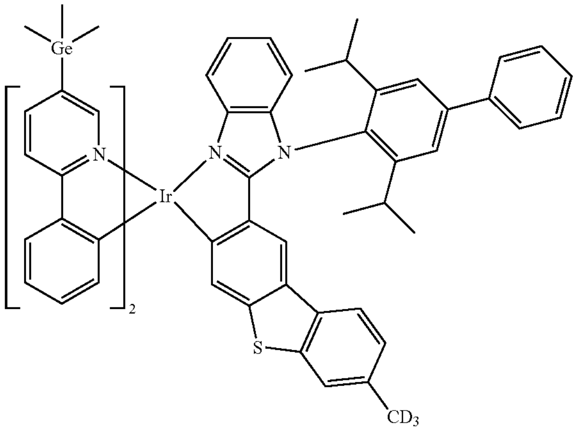
1762
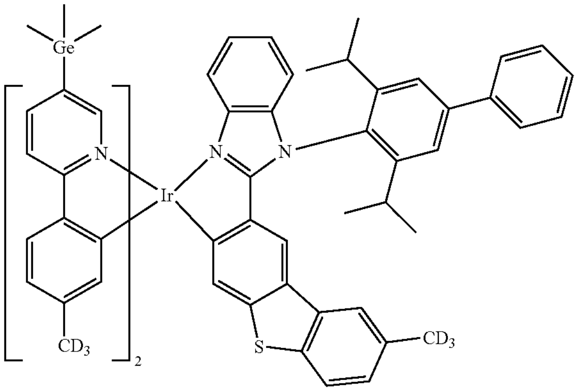

-continued
1763
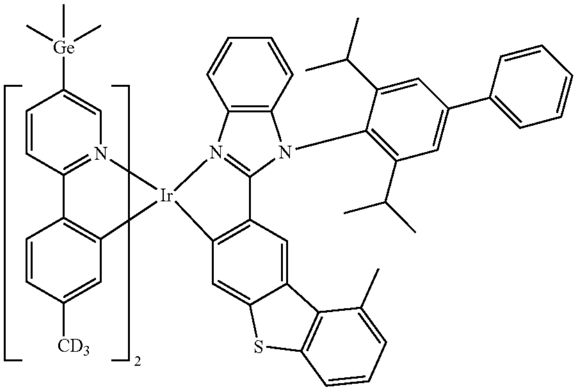
1764
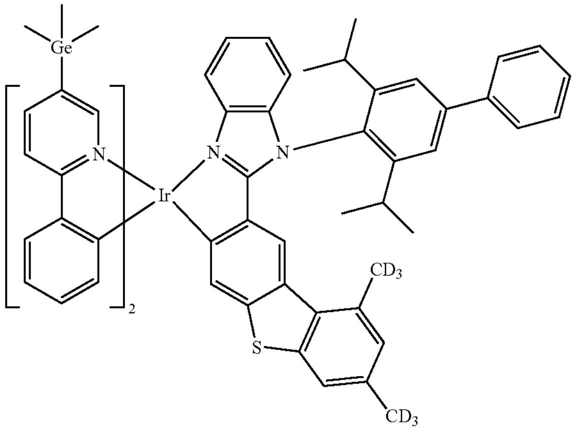
1765
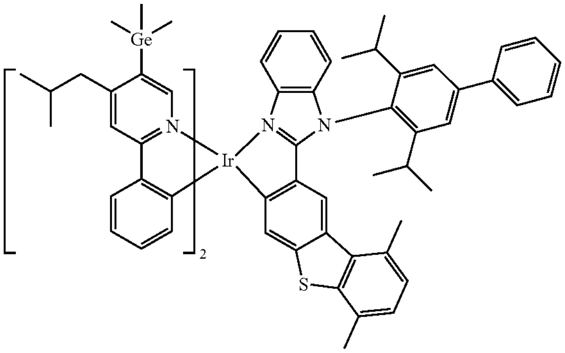
1766
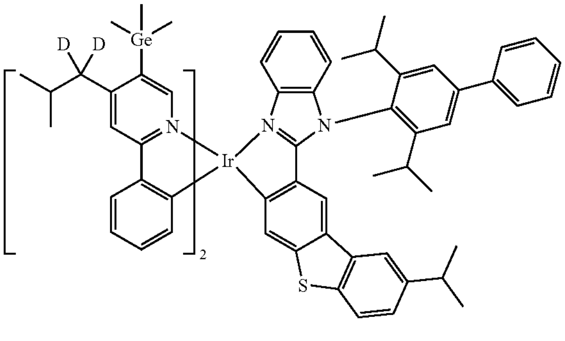
-continued
1767
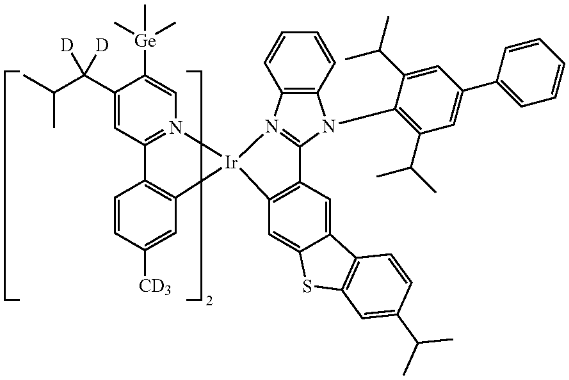
1768
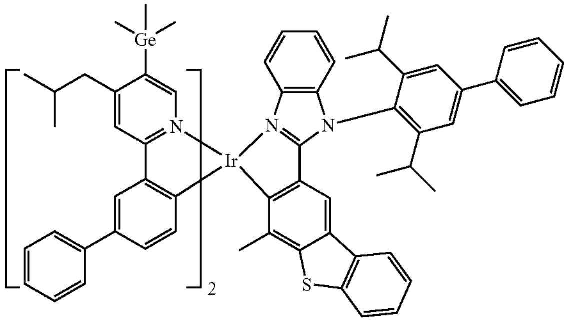
1769
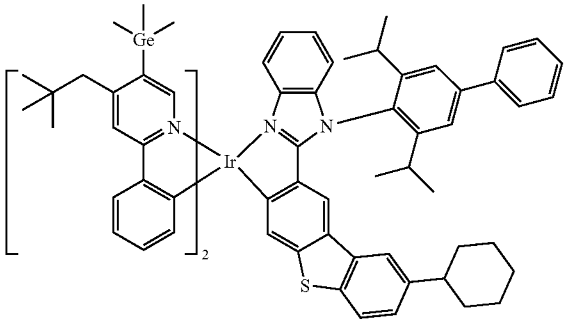
1770
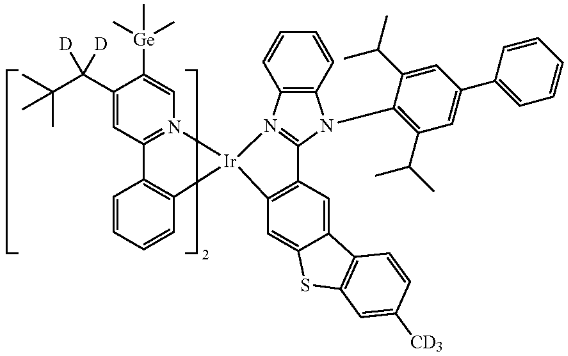

-continued
1771
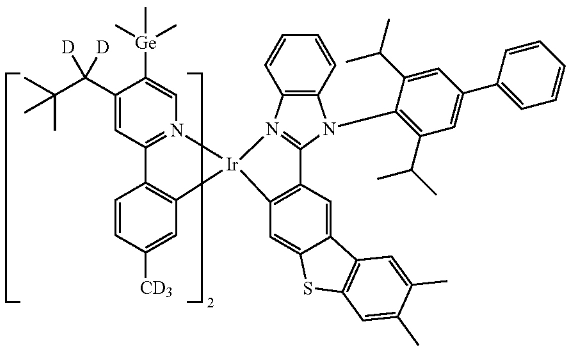
1772
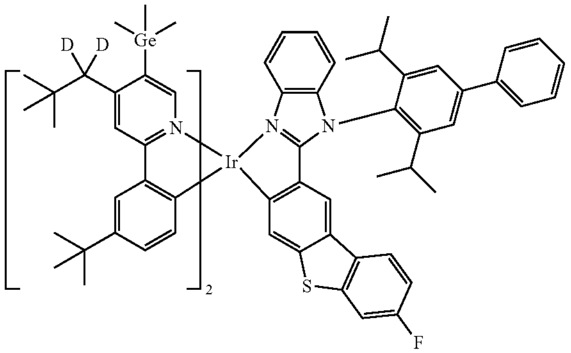
1773
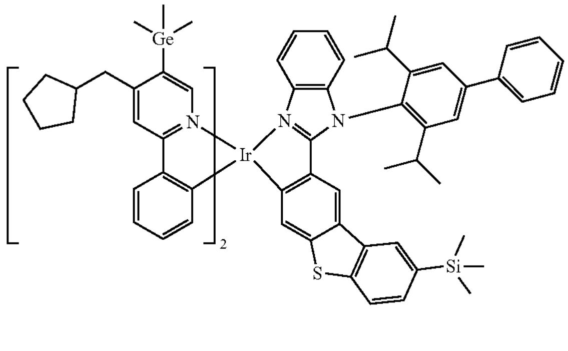
1774
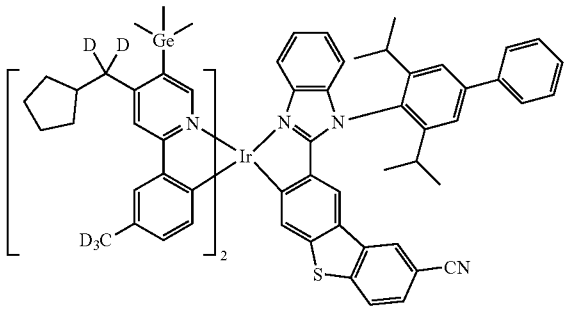
-continued
1775
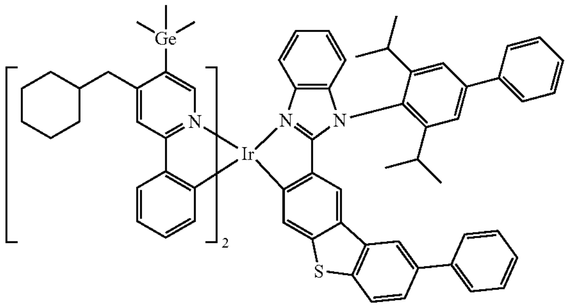
1776
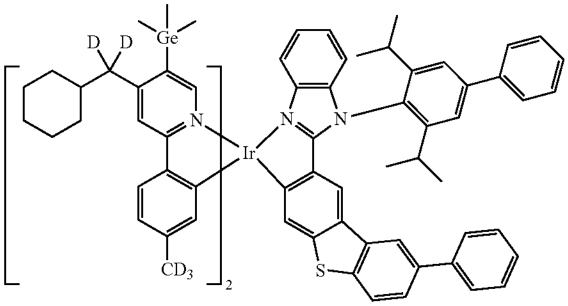
1777
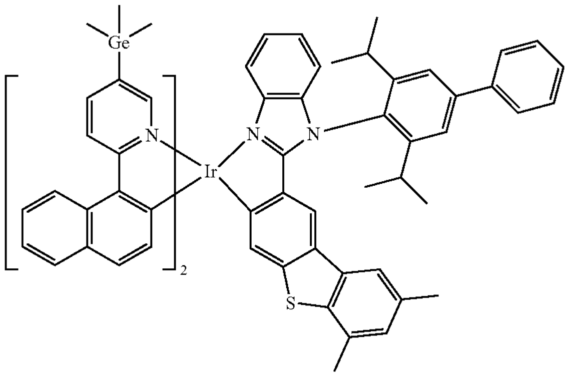
1778
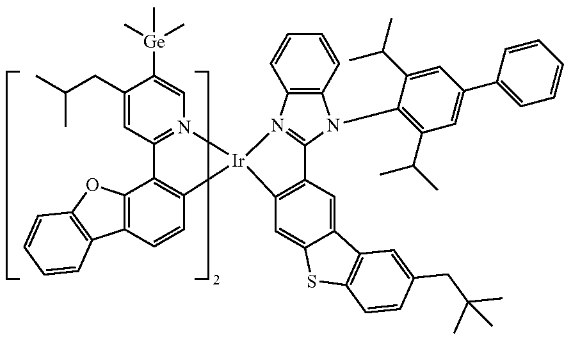

-continued
1779
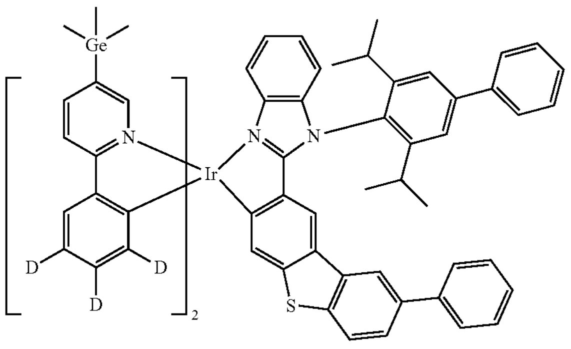
1780
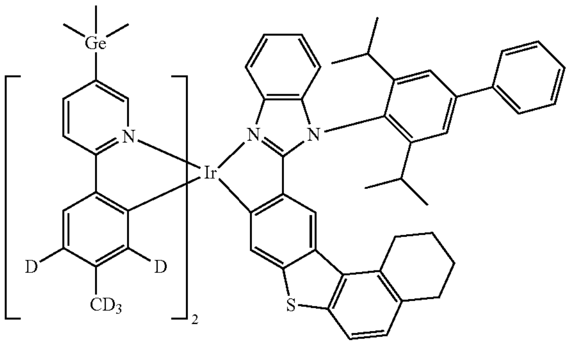
1781
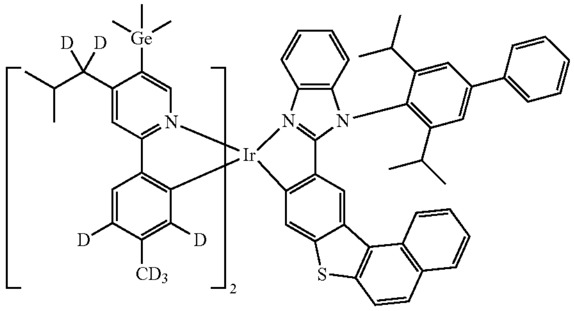
1782
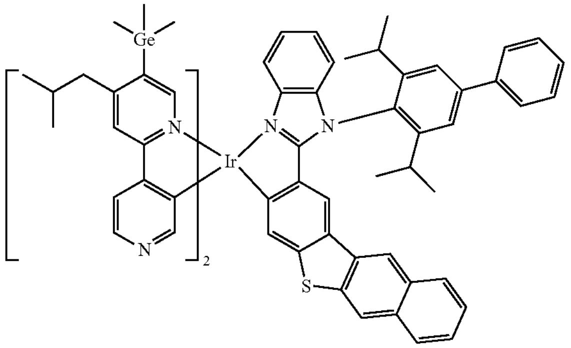
-continued
1783
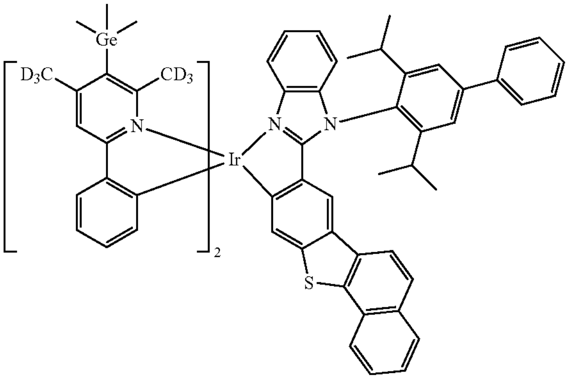
1784
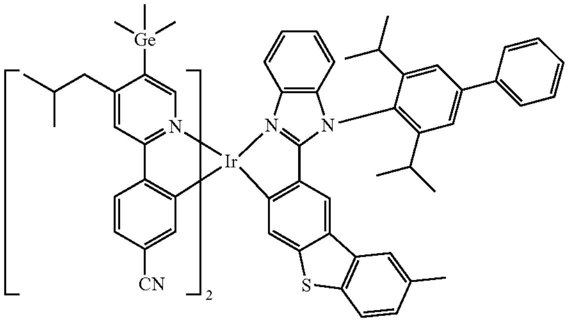
1785
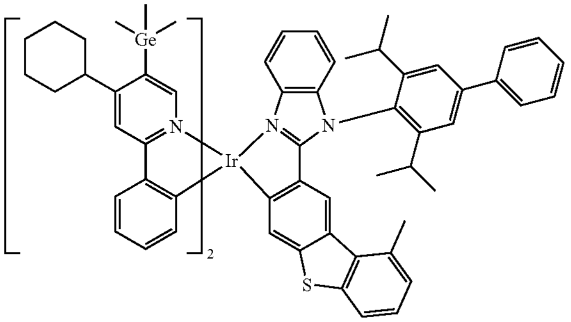
1786
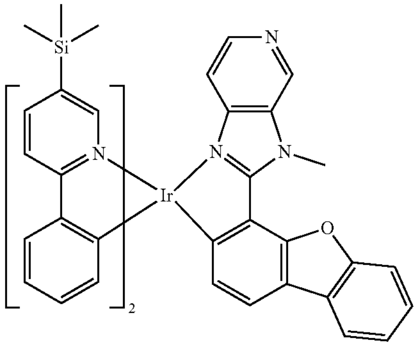

-continued
1787
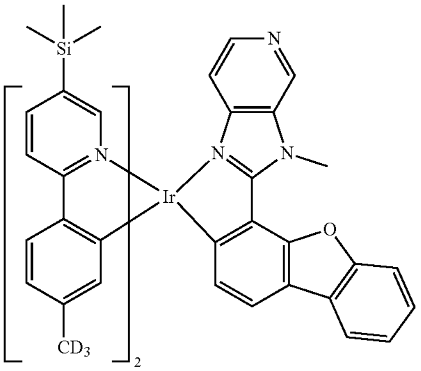
1788
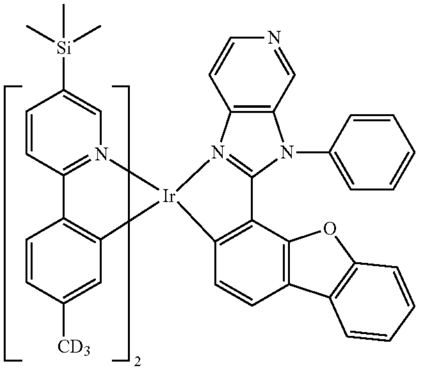
1789
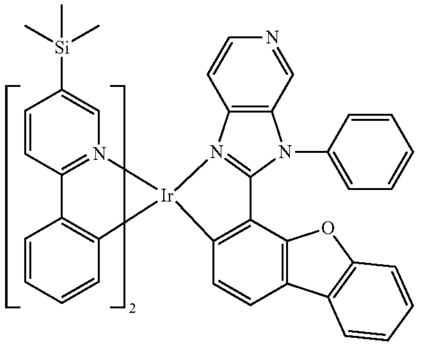
1790
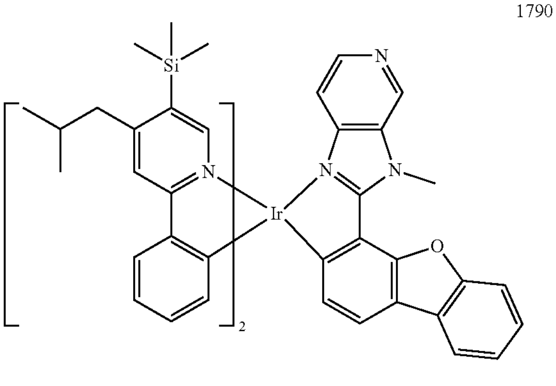
-continued
1791
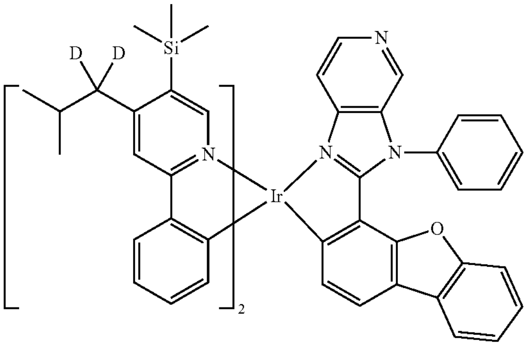
1792
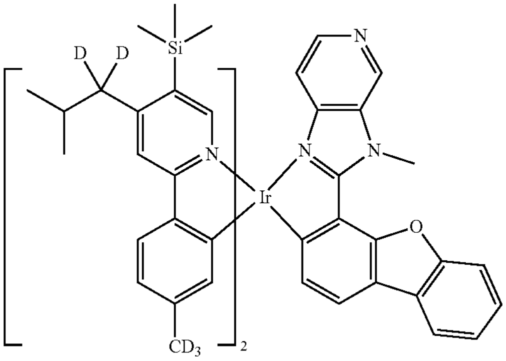
1793
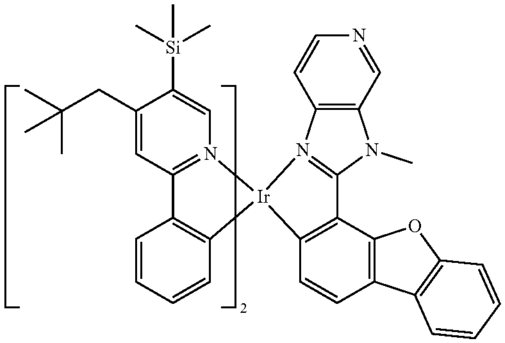
1794
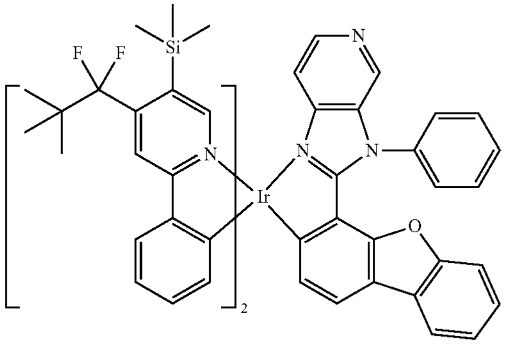

1795
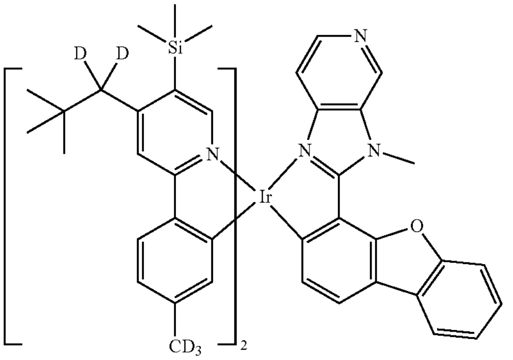
1796
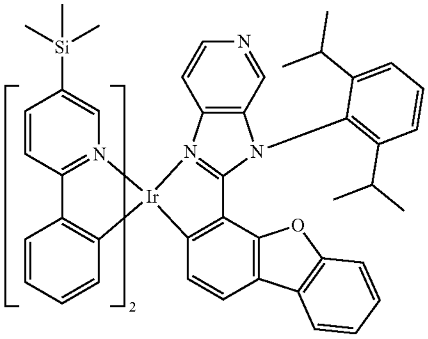
1797
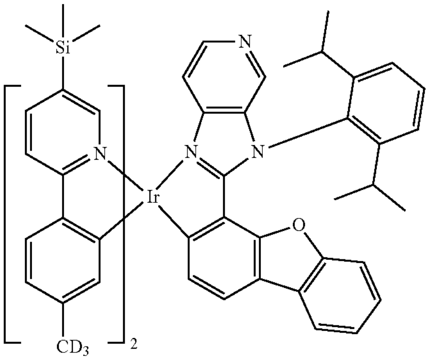
1798
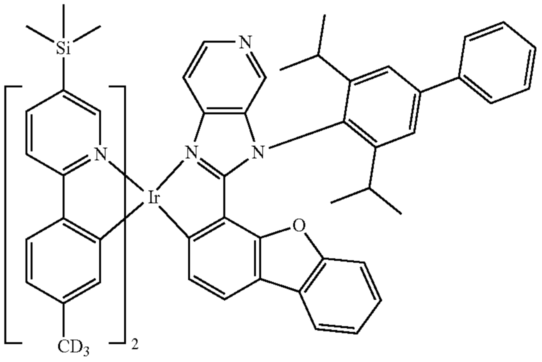
1799
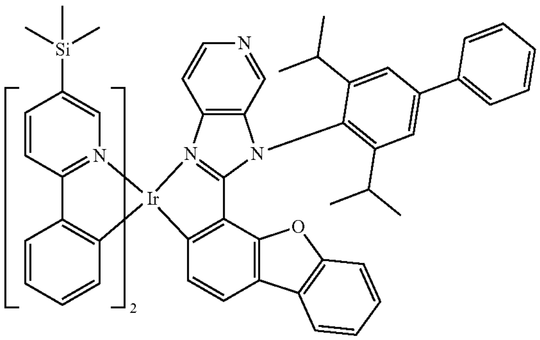
1800
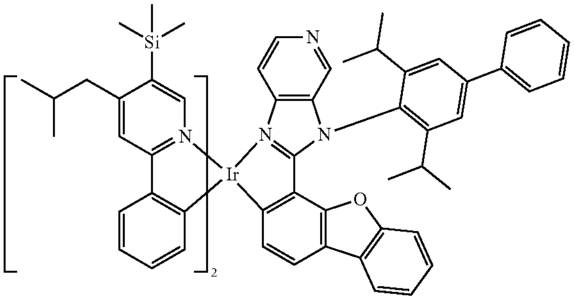
1801
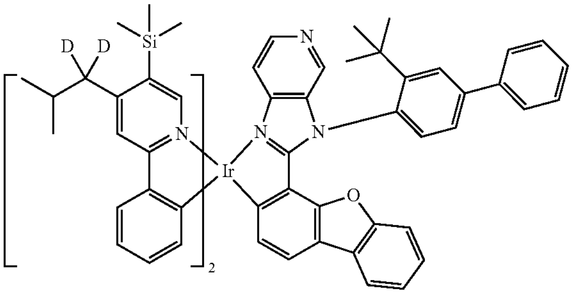
1802
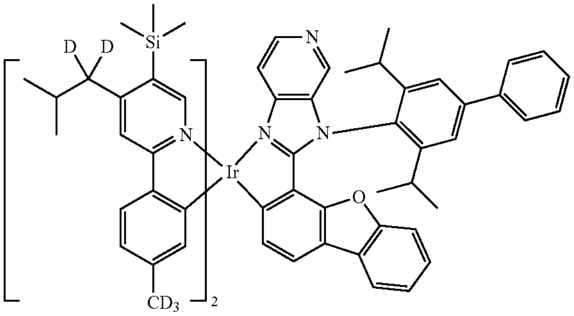

-continued
1803
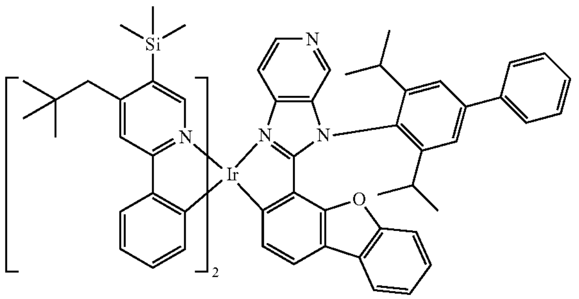
1804
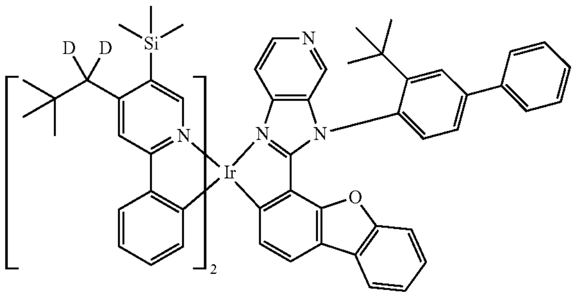
1805
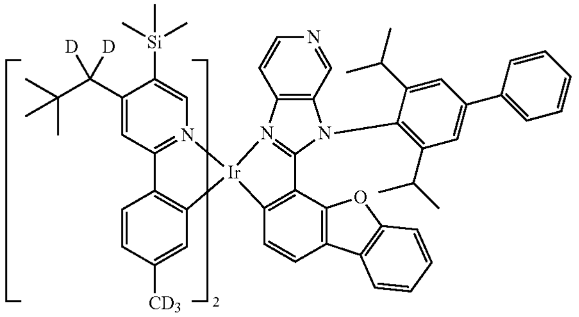
1806
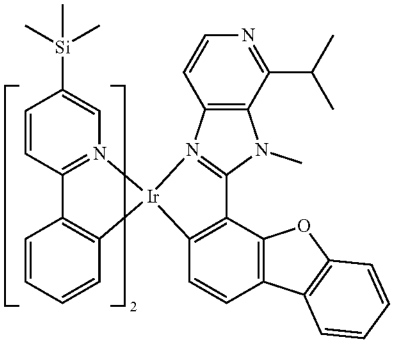
-continued
1807
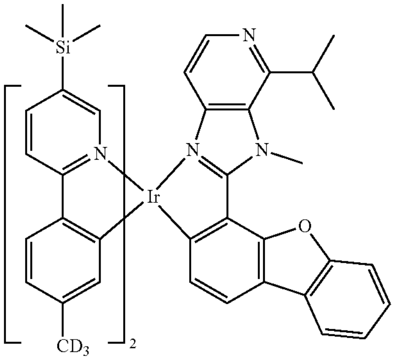
1808
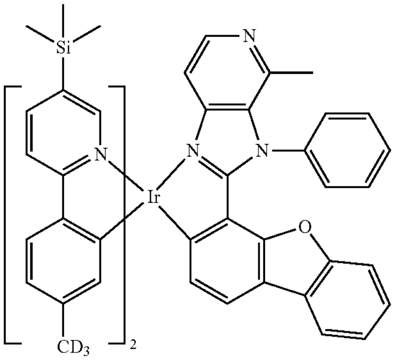
1809
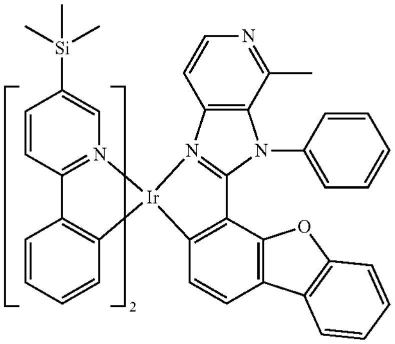
1810
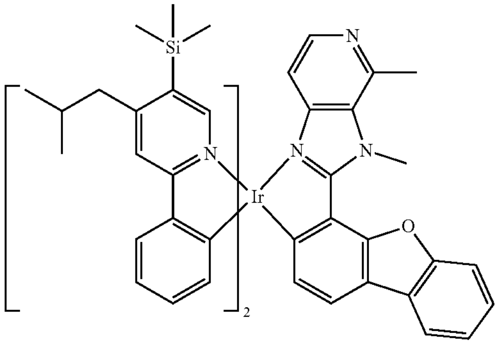

-continued
1811
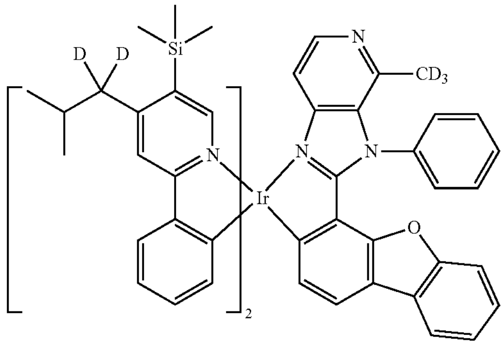
1812
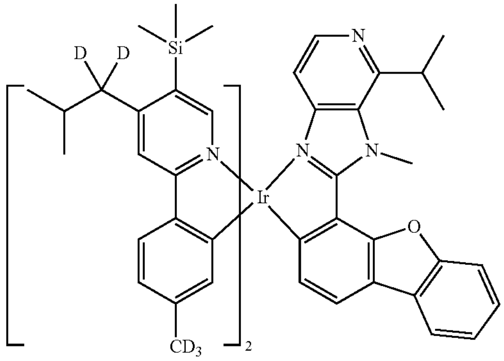
1813
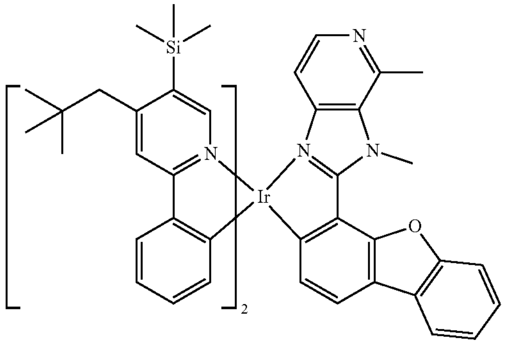
1814
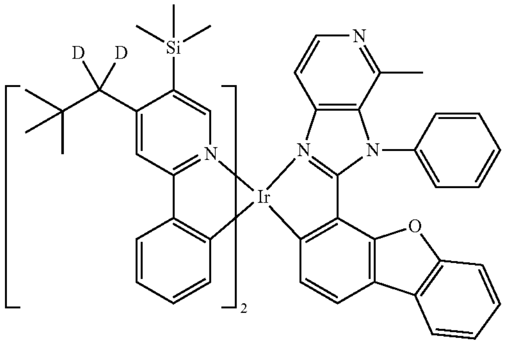
-continued
1815
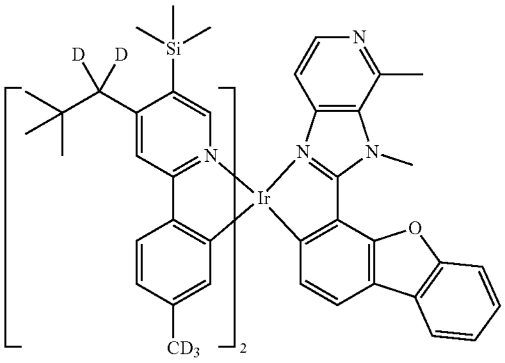
1816
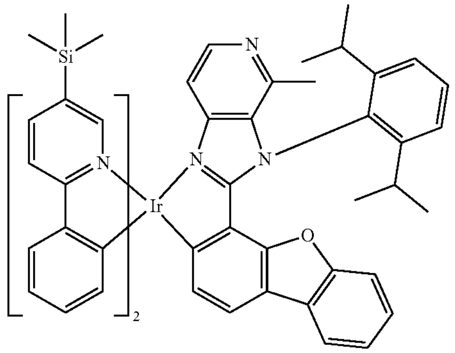
1817
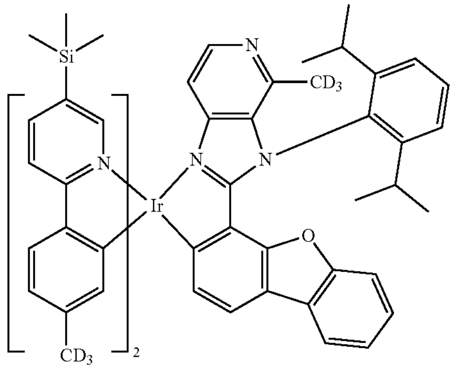
1818
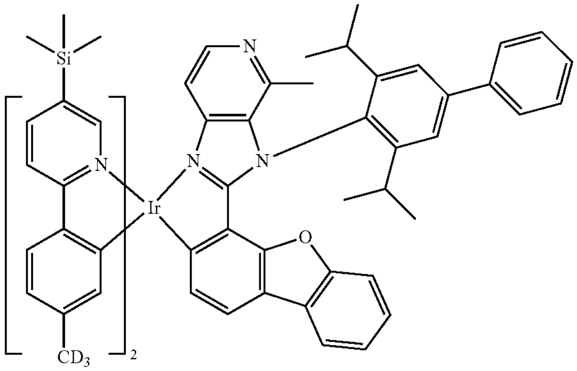

-continued
1819
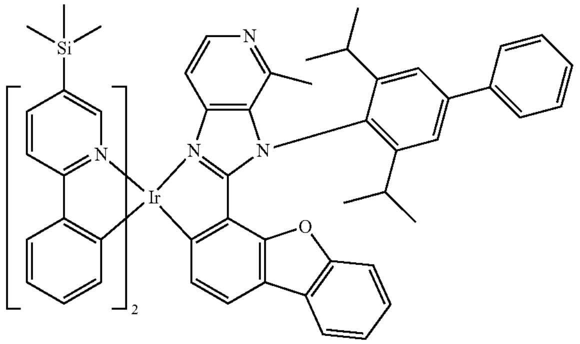
1820
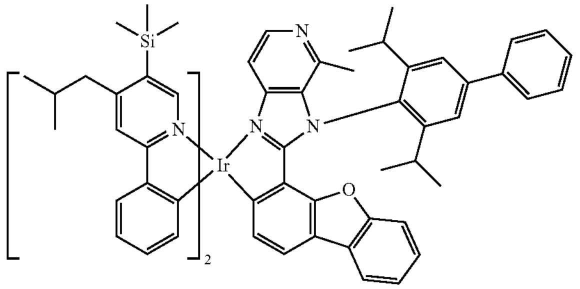
1821
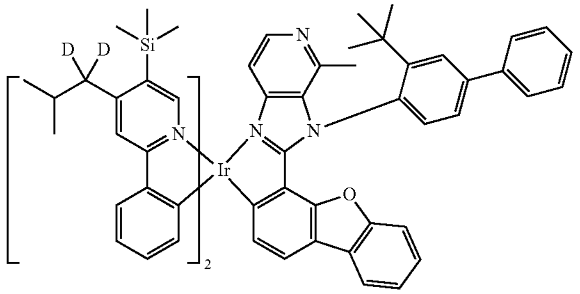
1822
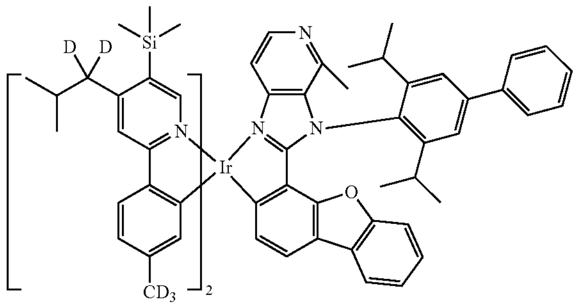
1823
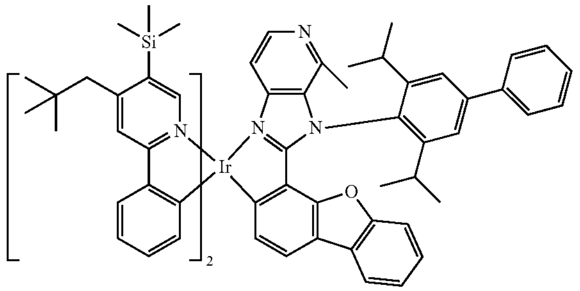
-continued
1824
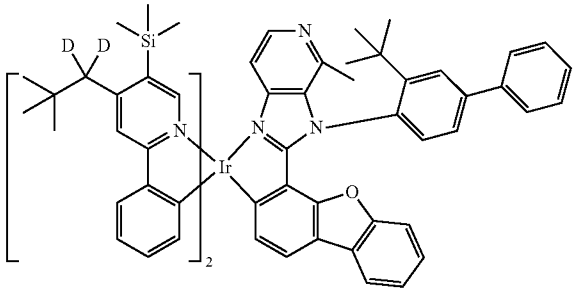
1825
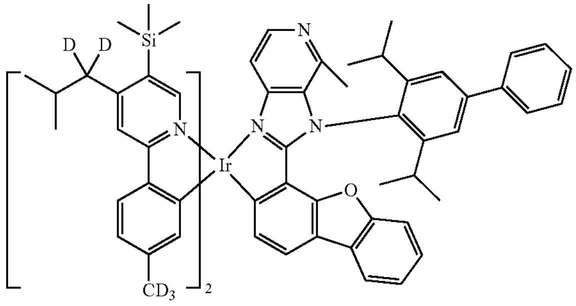
1826
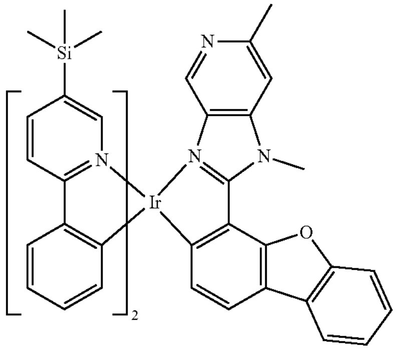
1827
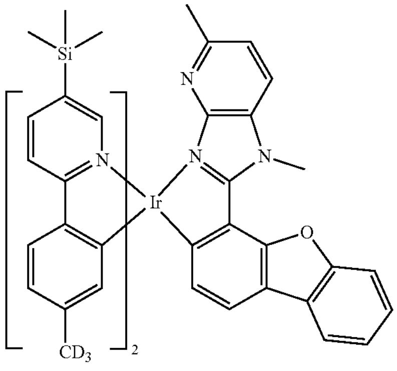

-continued
1828
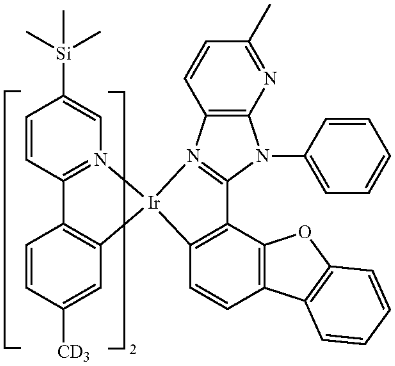
1829
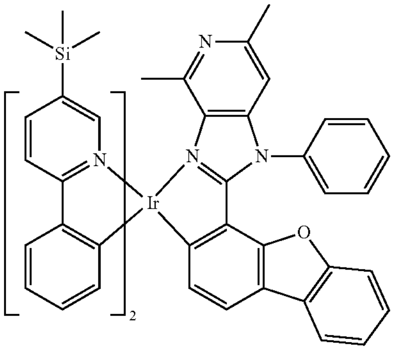
1830
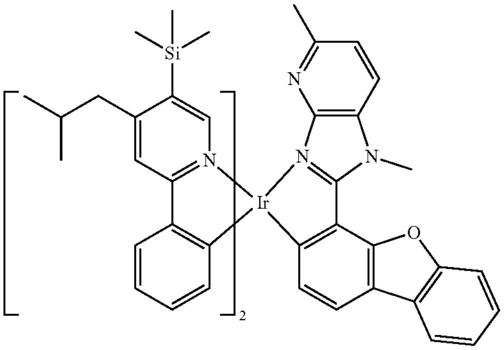
1831
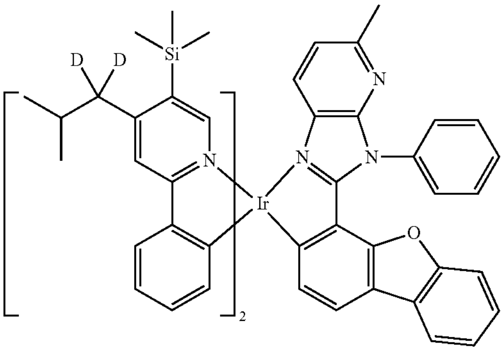
-continued
1832
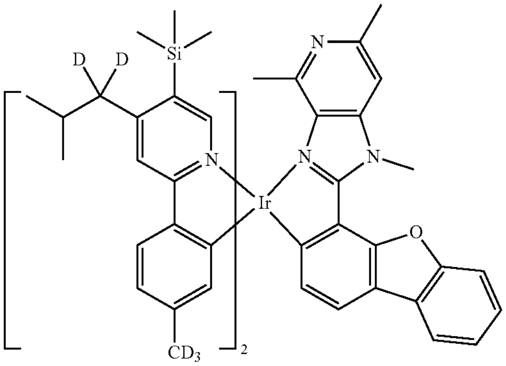
1833
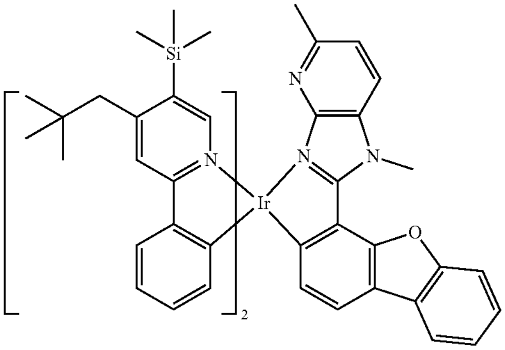
1834
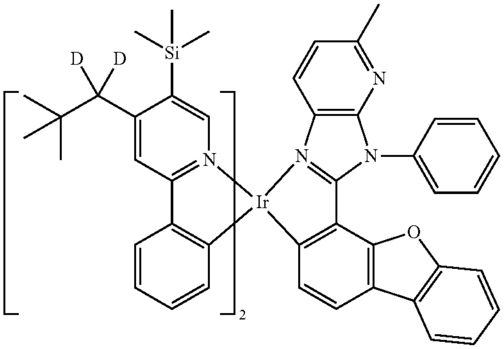
1835
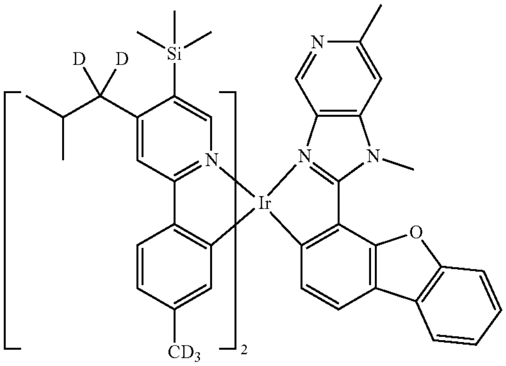

-continued
1836
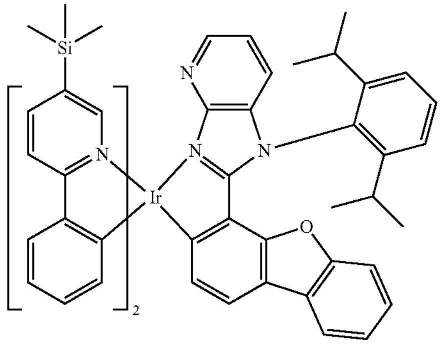
1837
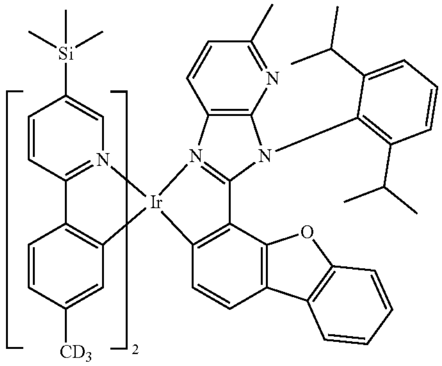
1838
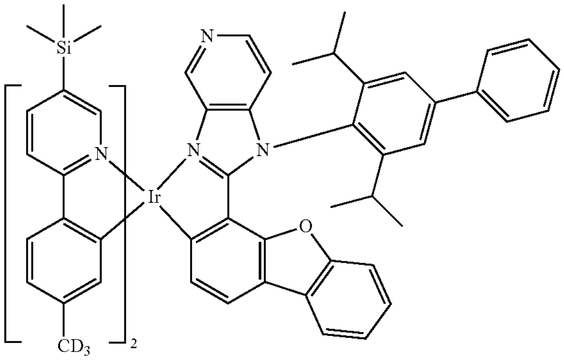
1839
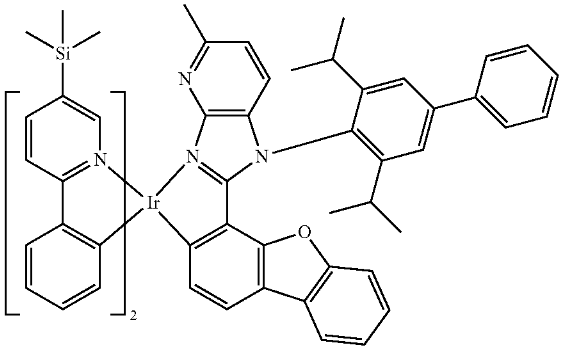
-continued
1840
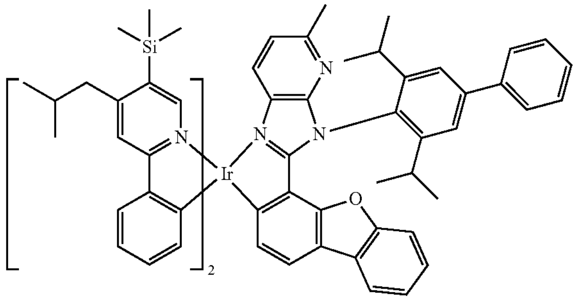
1841
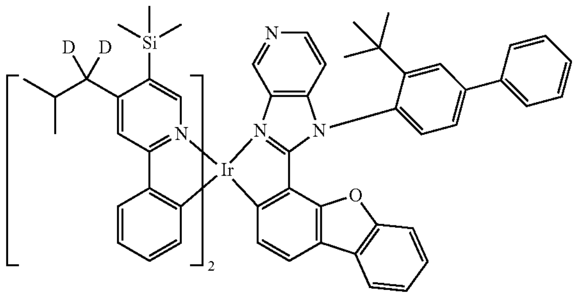
1842
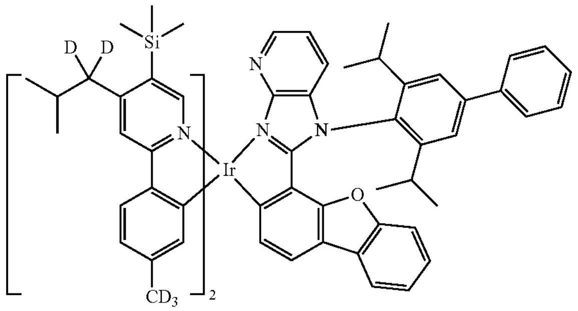
1843
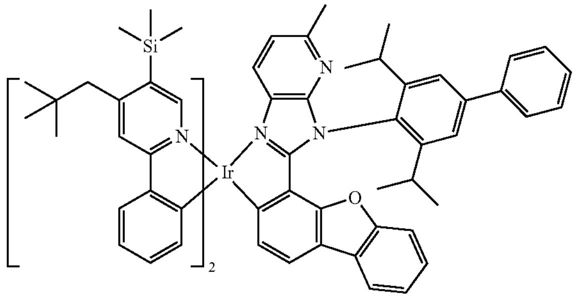
1844
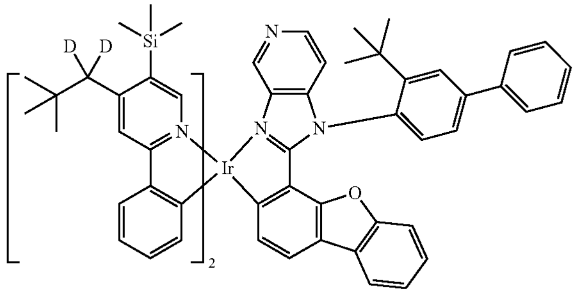

-continued
1845
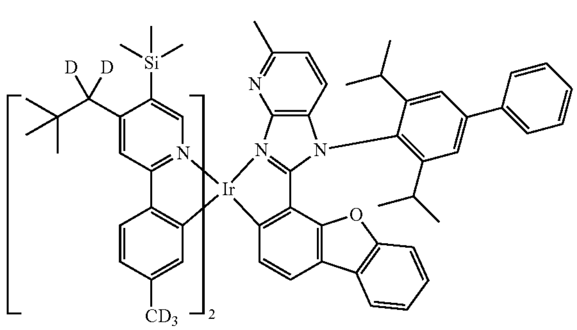
1846
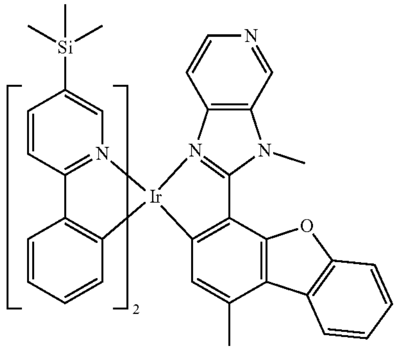
1847
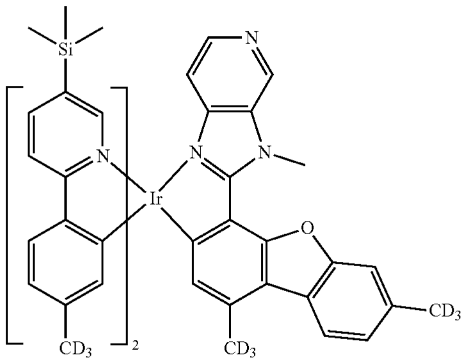
1848
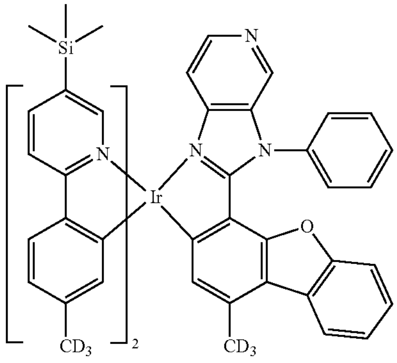
-continued
1849
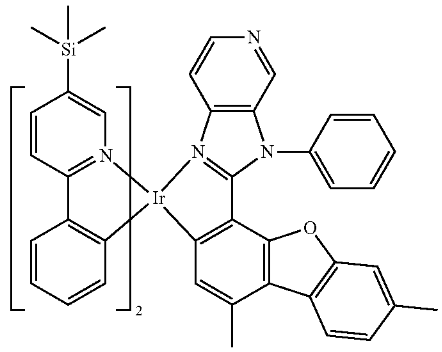
1850
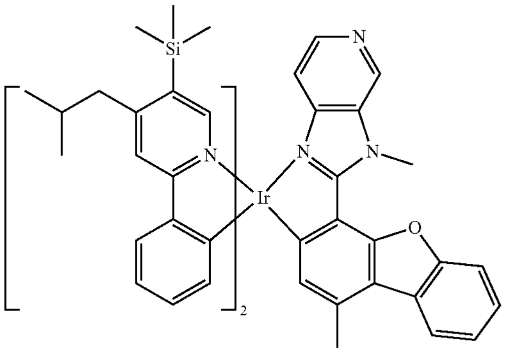
1851
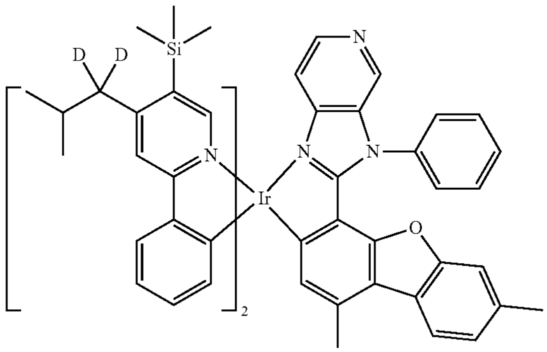
1852
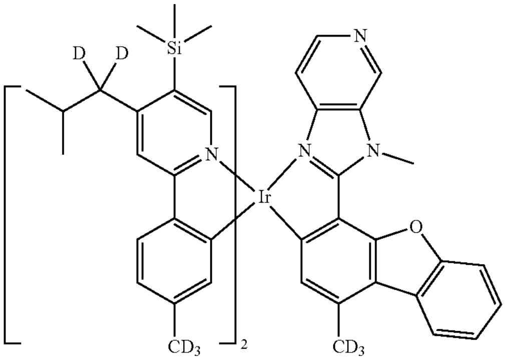

-continued
1853
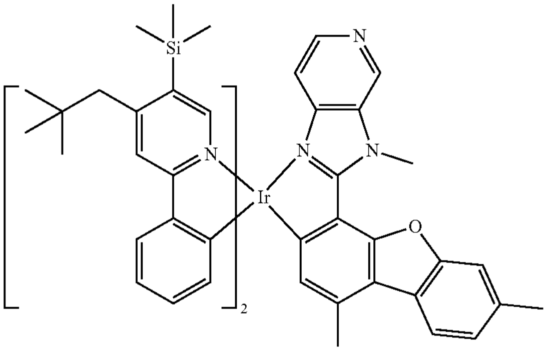
1854
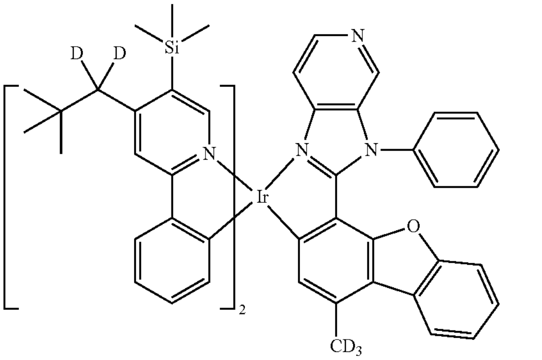
1855
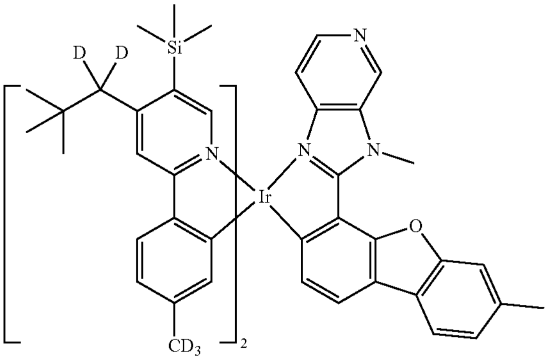
1856
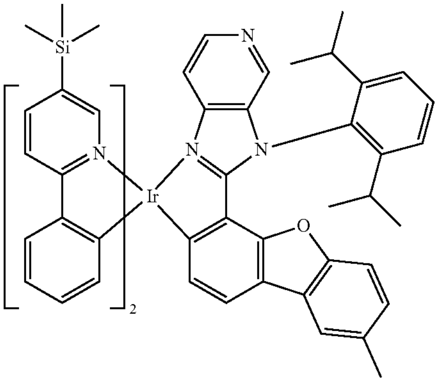
-continued
1857
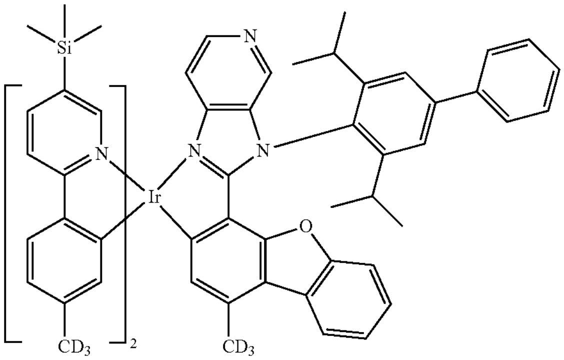
1858
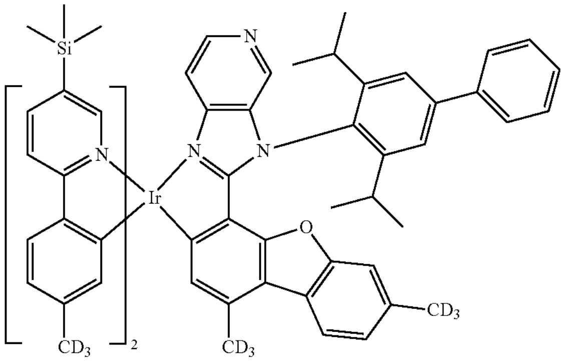
1859
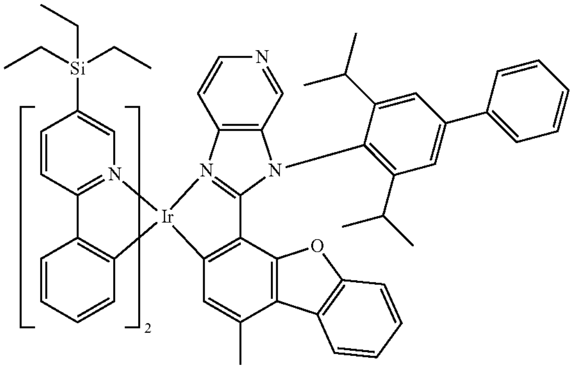
1860
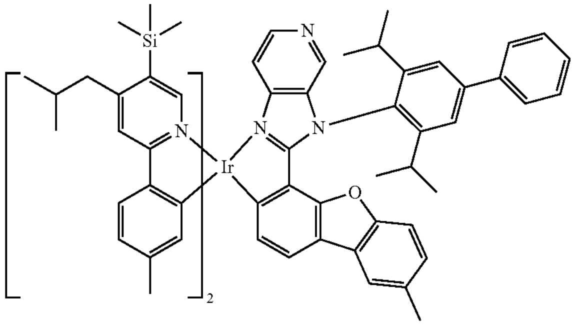

-continued
1861
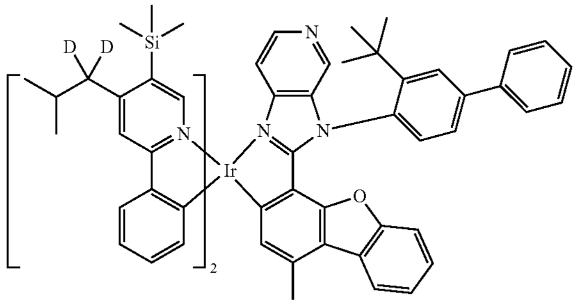
1862
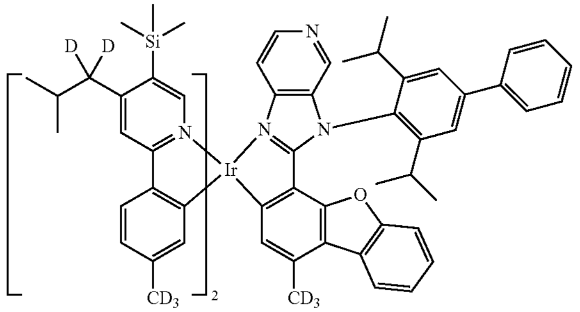
1863
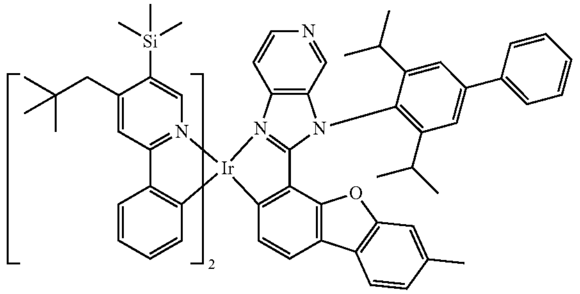
1864
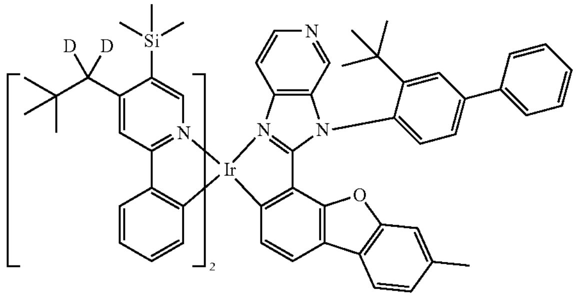
1865
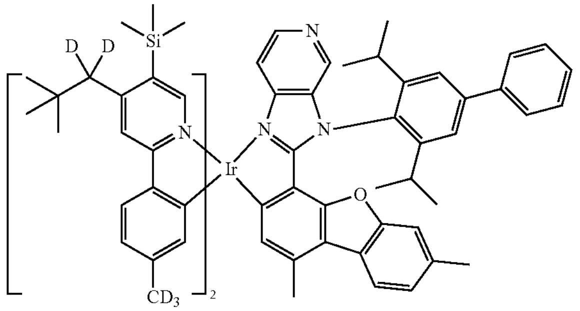
-continued
1866
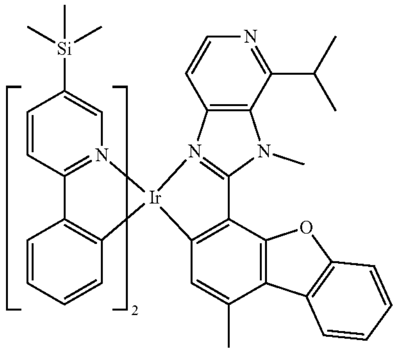
1867
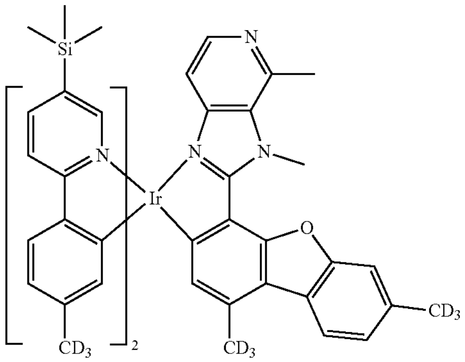
1868
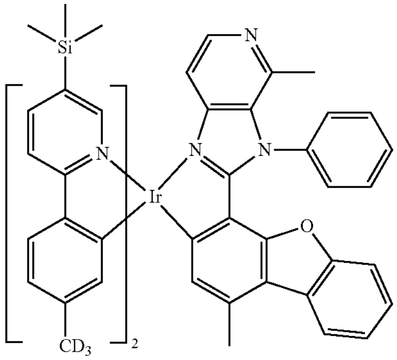
1869
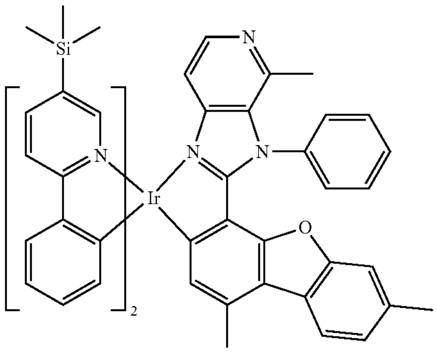

-continued
1870
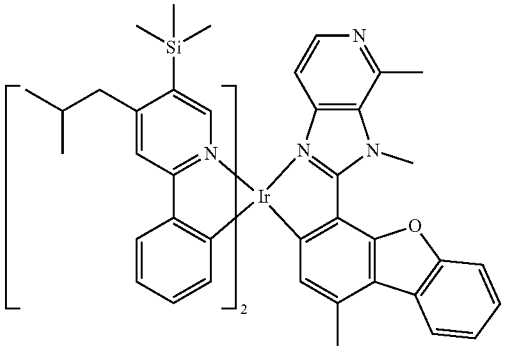
1871
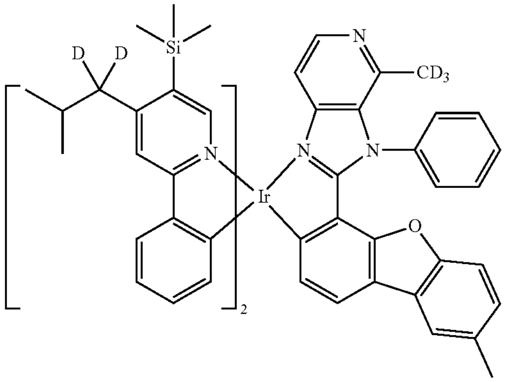
1872
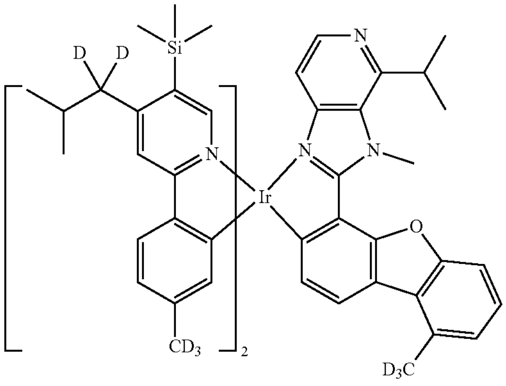
1873
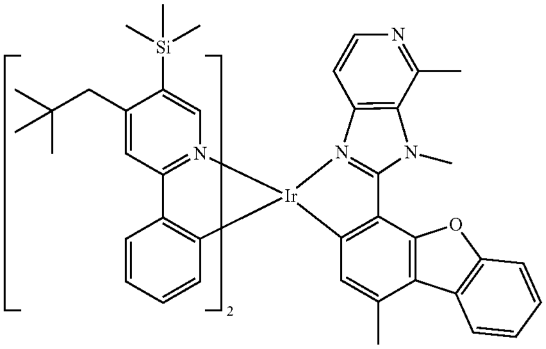
-continued
1874
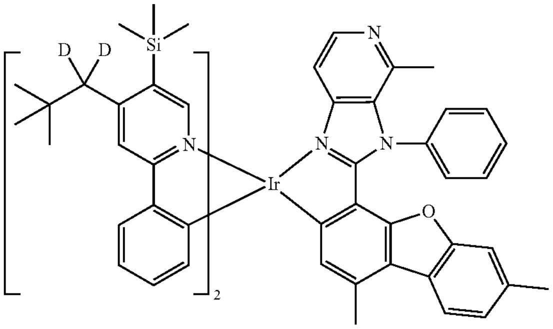
1875
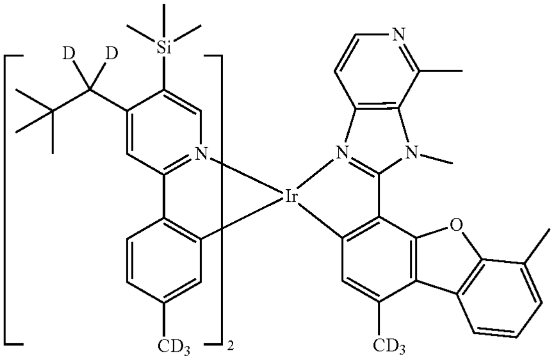
1876
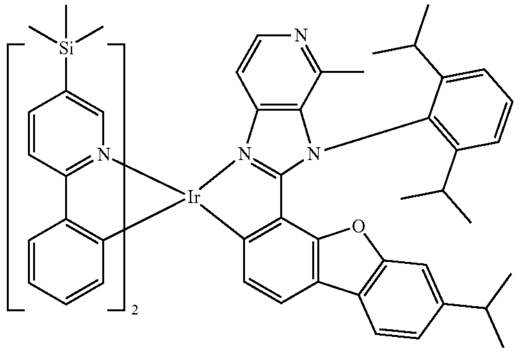
1877
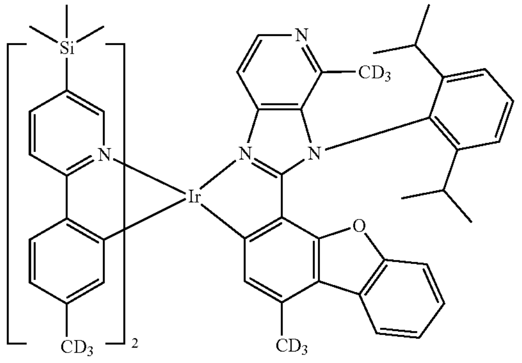

-continued
1878
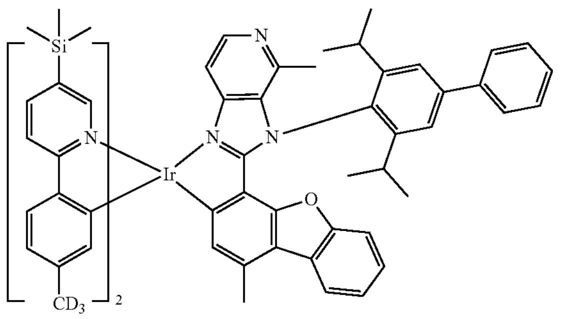
1879
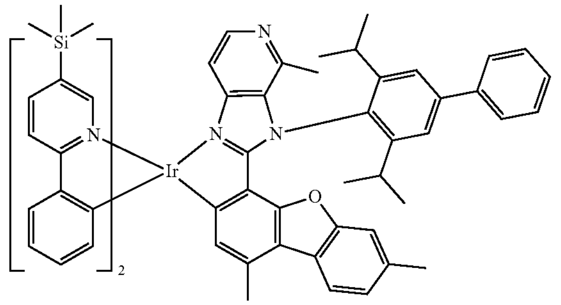
1880
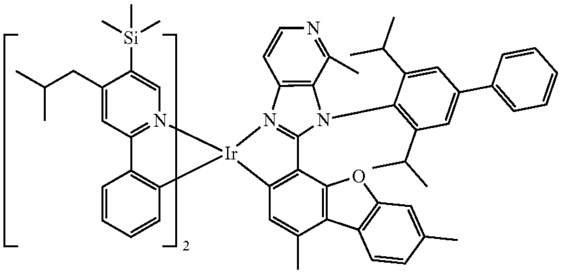
1881
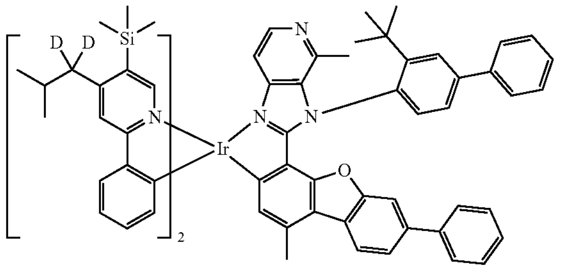
1882
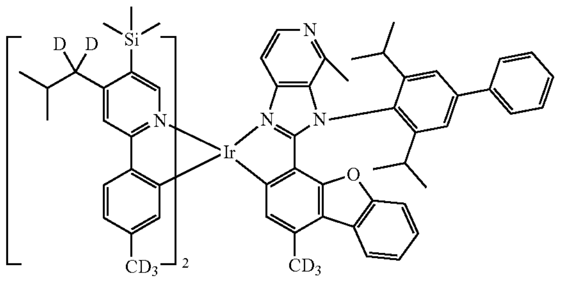
-continued
1883
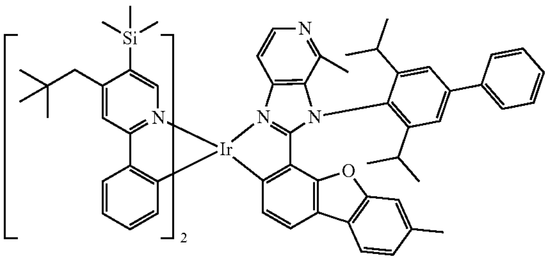
1884
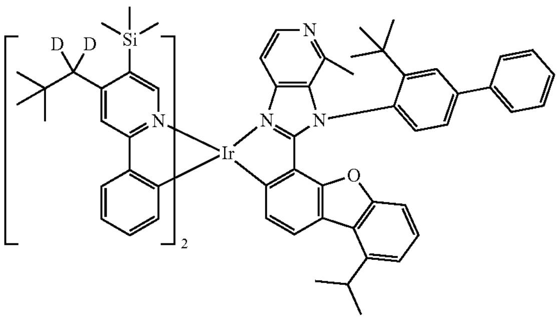
1885
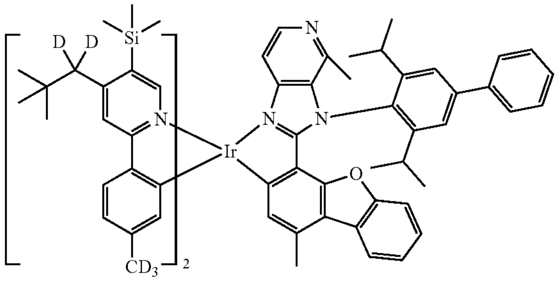
1886
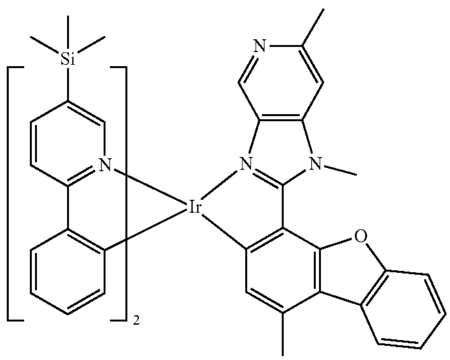

-continued
1887
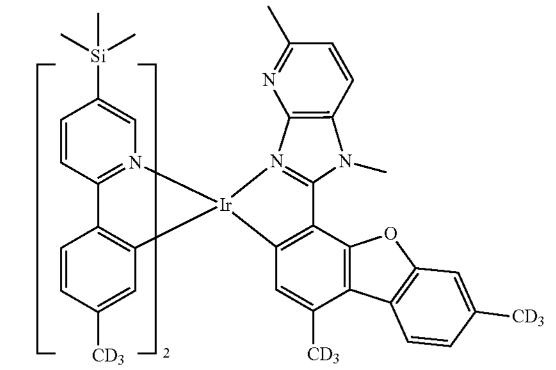
1888
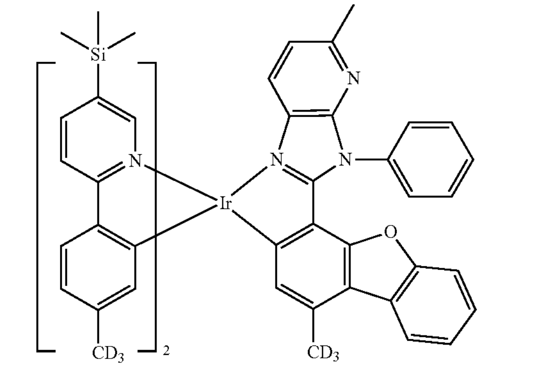
1889
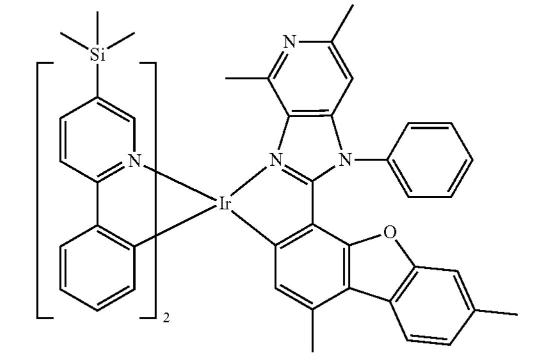
1890
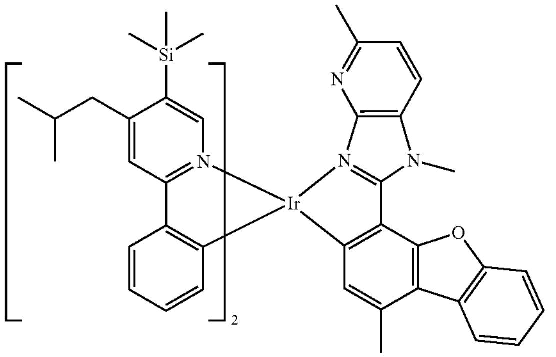
-continued
1891
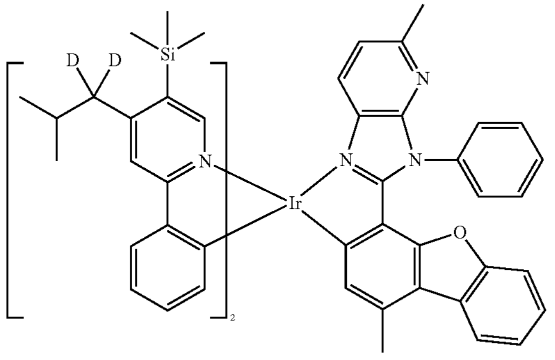
1892
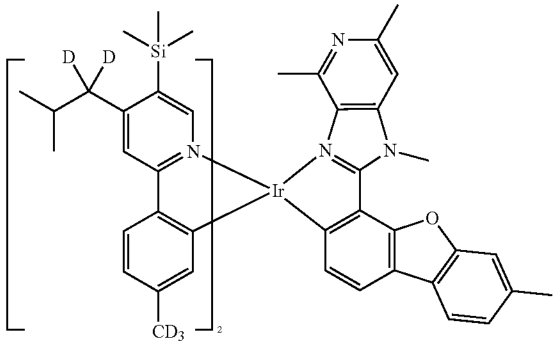
1893
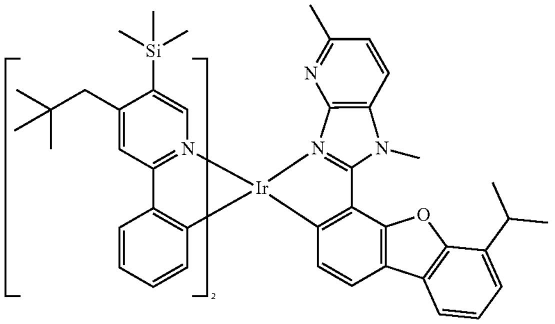
1894
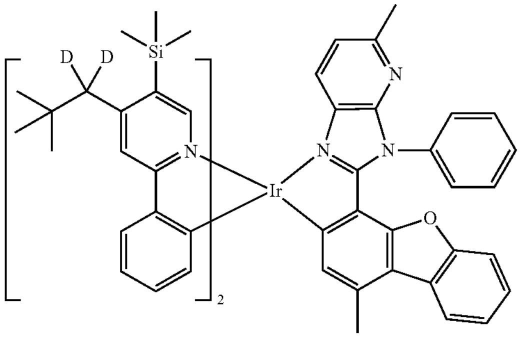

1895
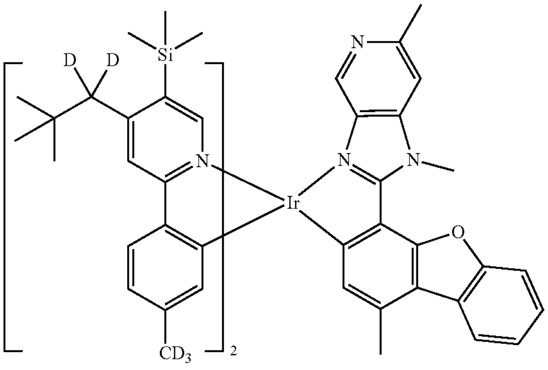
1896
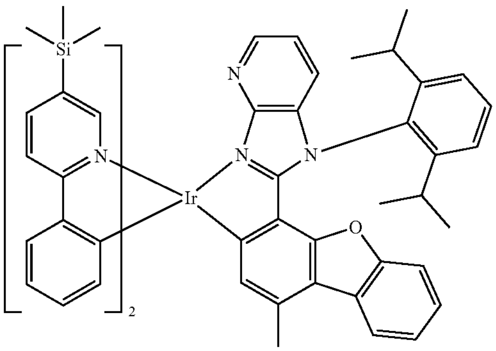
1897
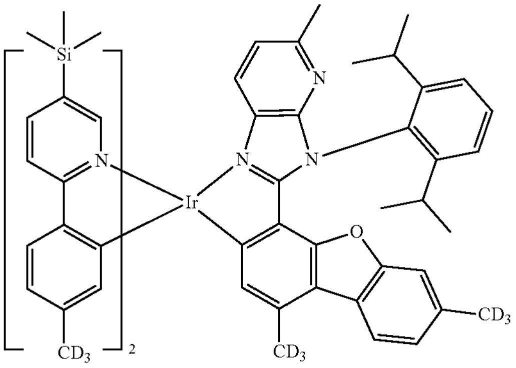
1898
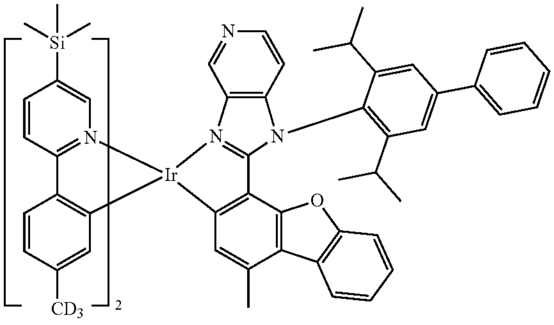
1899
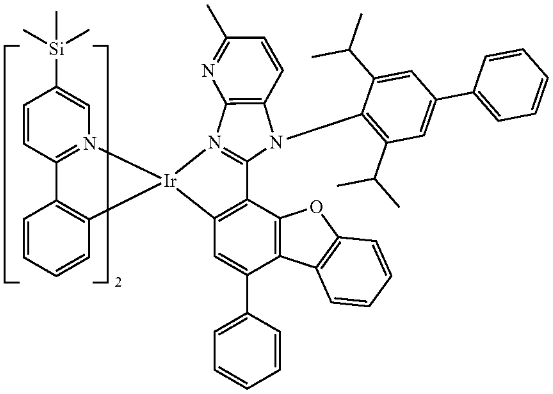
1900
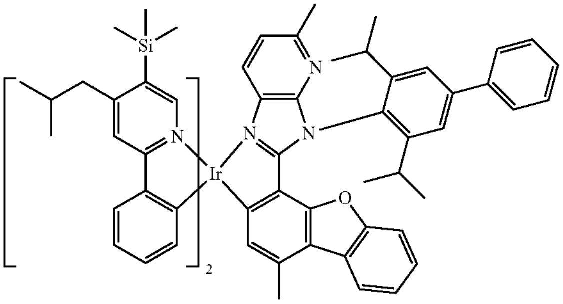
1901
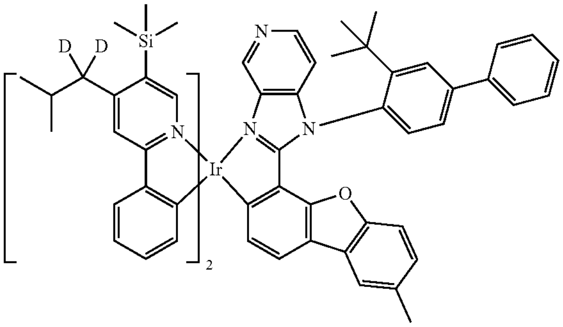
1902
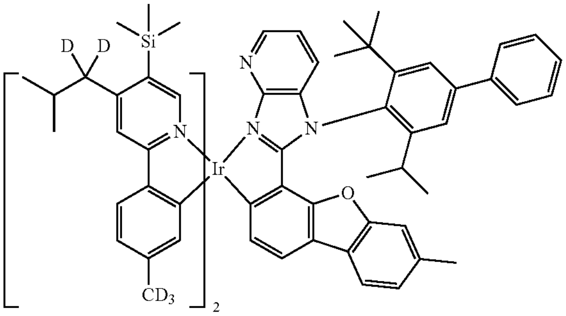

-continued
1903
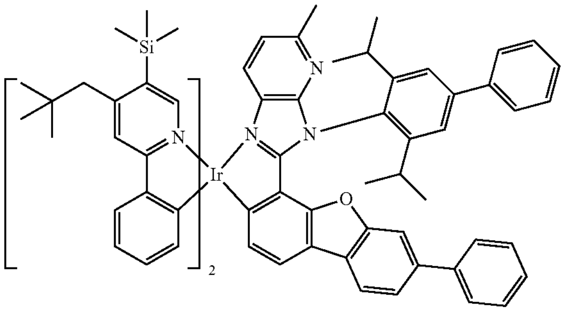
1904
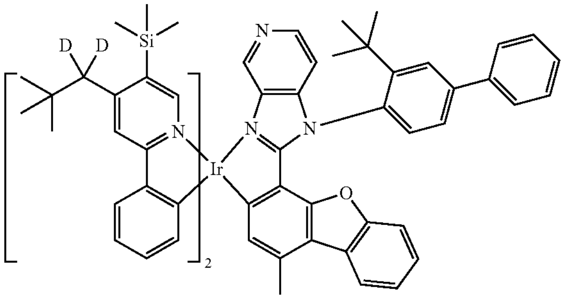
1905
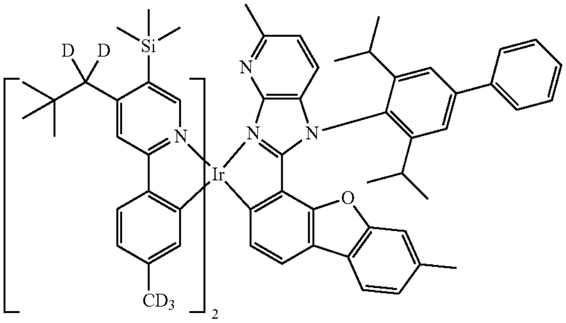
1906
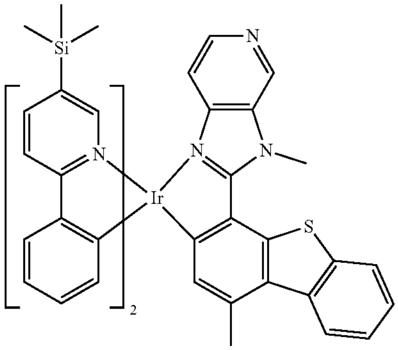
-continued
1907
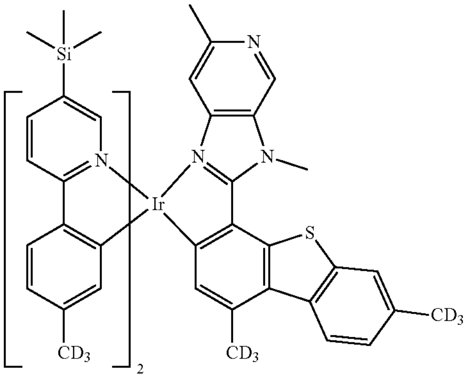
1908
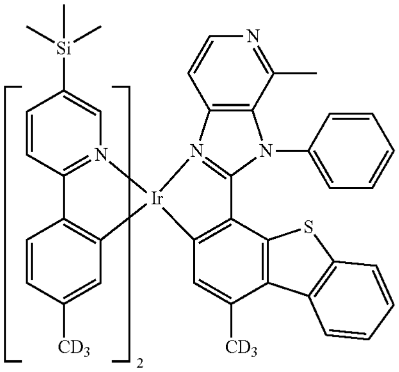
1909
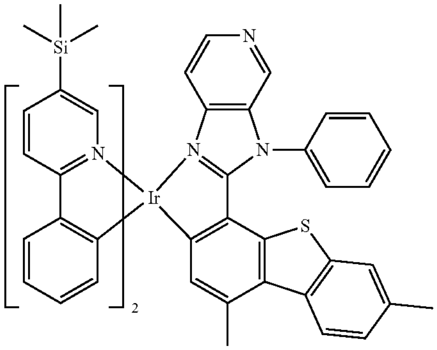
1910
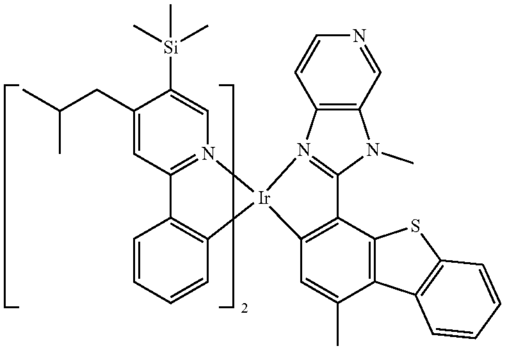

-continued
1911
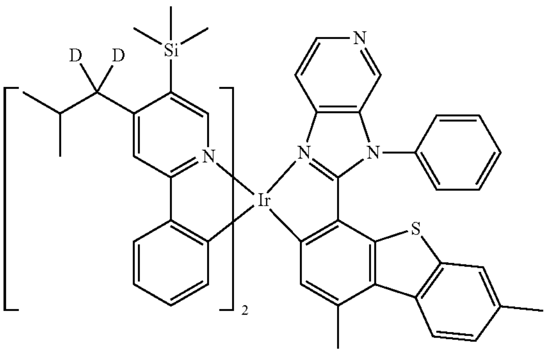
1912
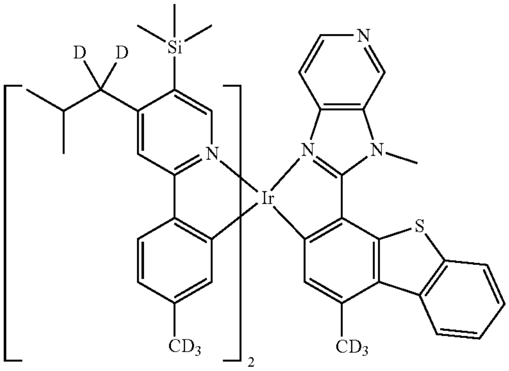
1913
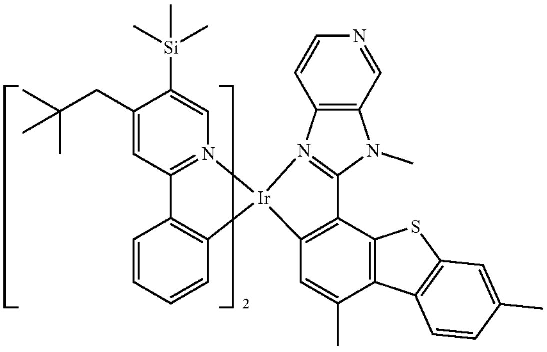
1914
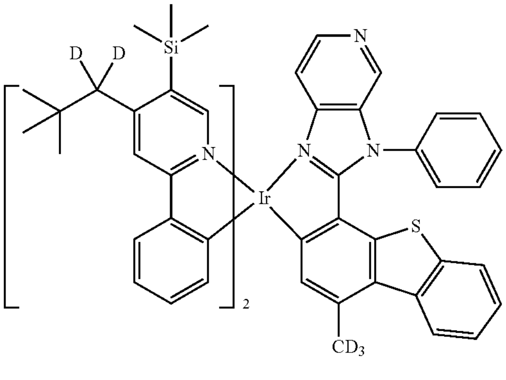
-continued
1915
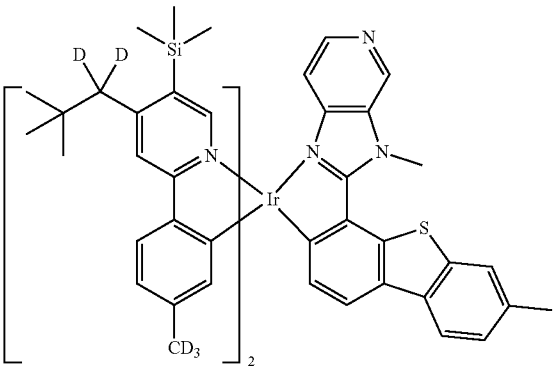
1916
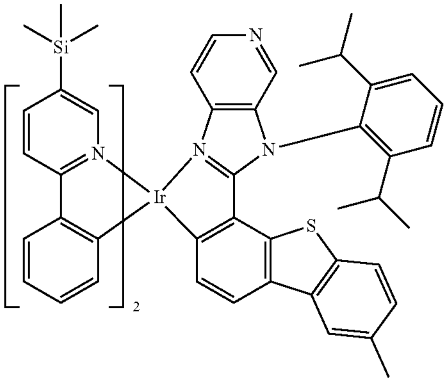
1917
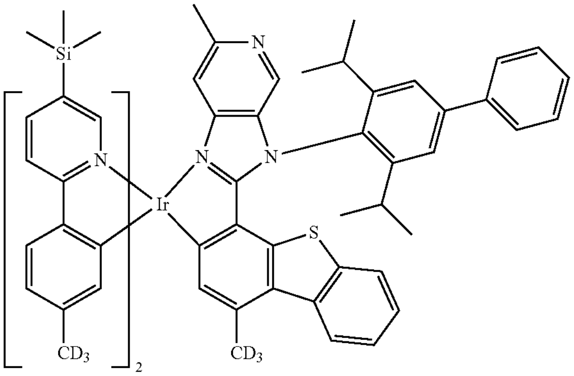
1918
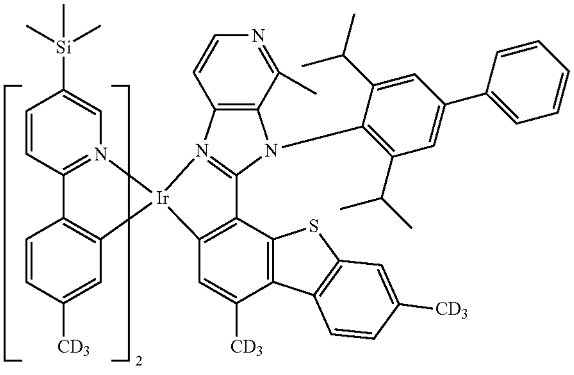

-continued
1919
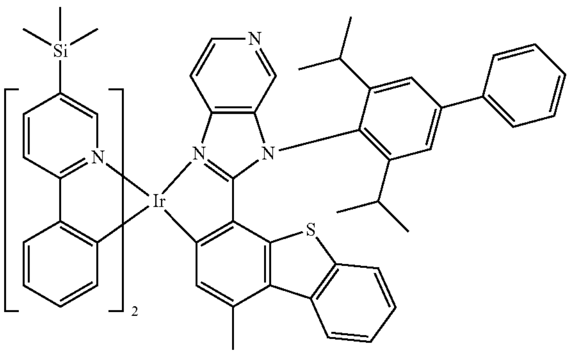
1920
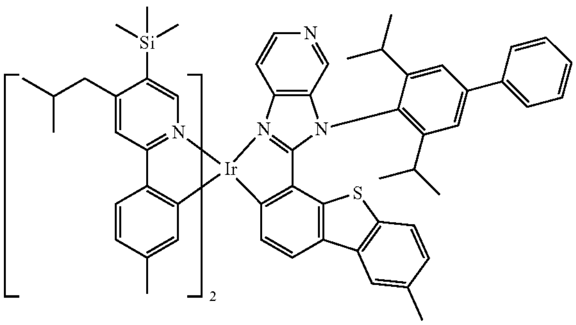
1921
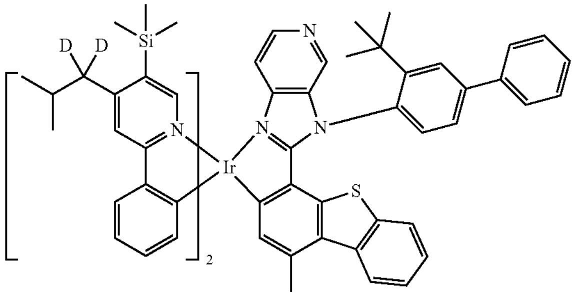
1922
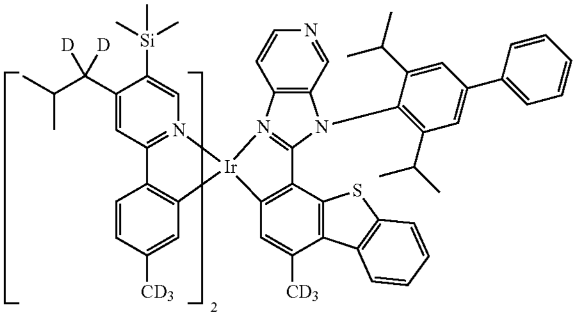
-continued
1923
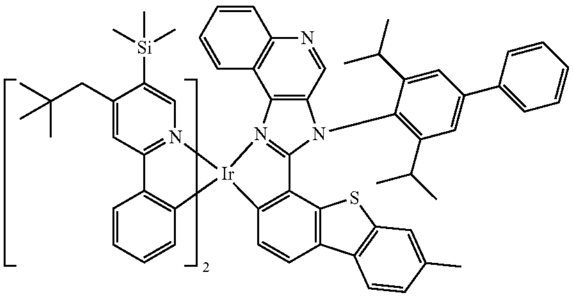
1924
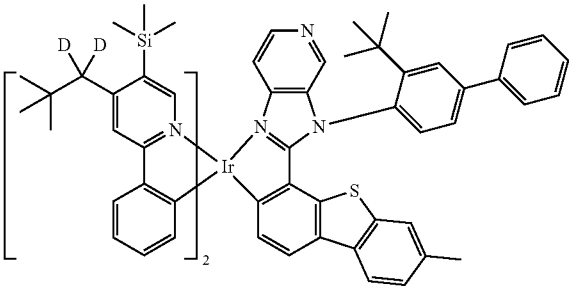
1925
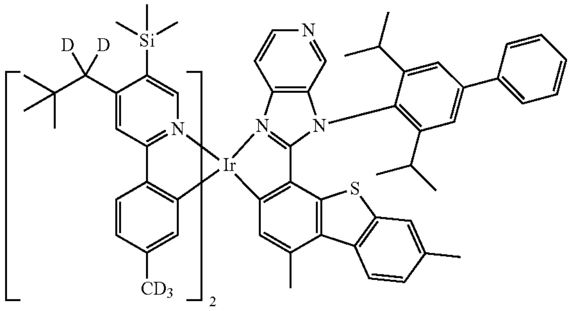
1926
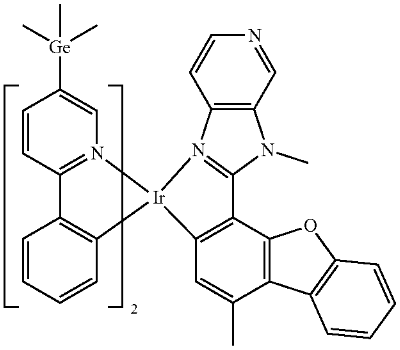

-continued
1927
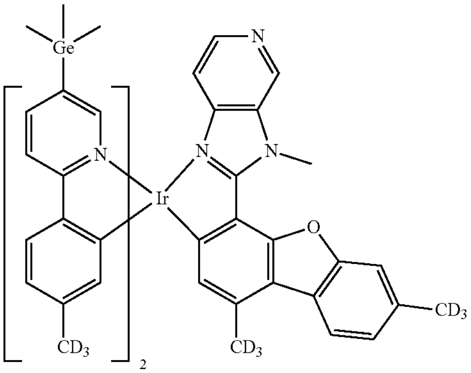
1928
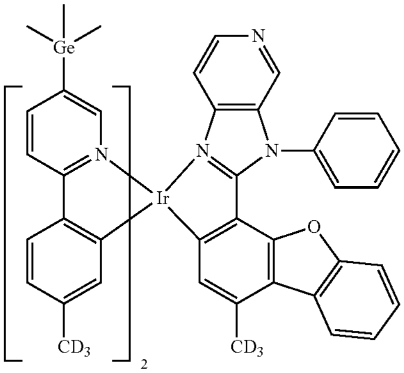
1929
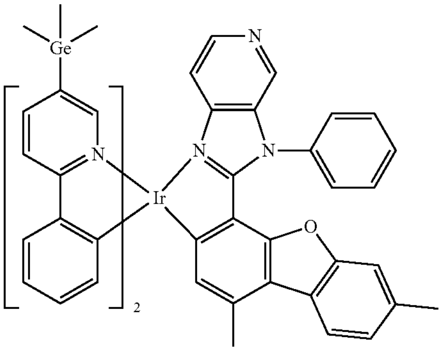
1930
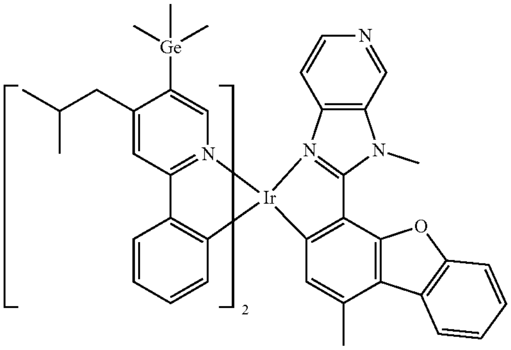
-continued
1931
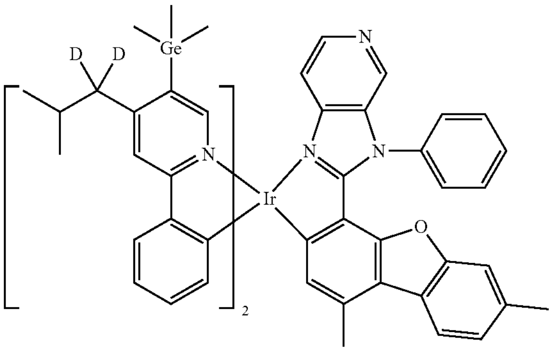
1932
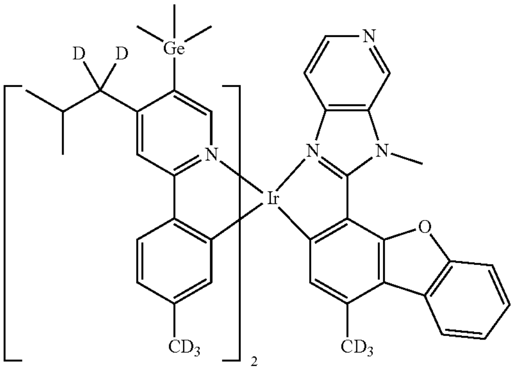
1933
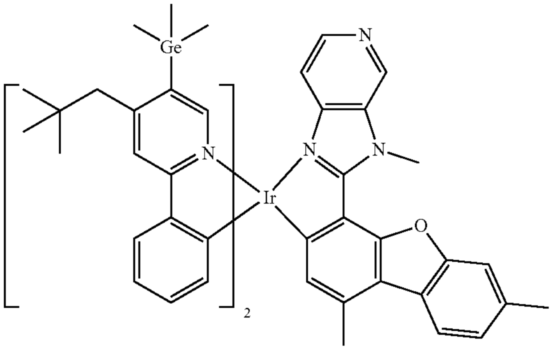
1934
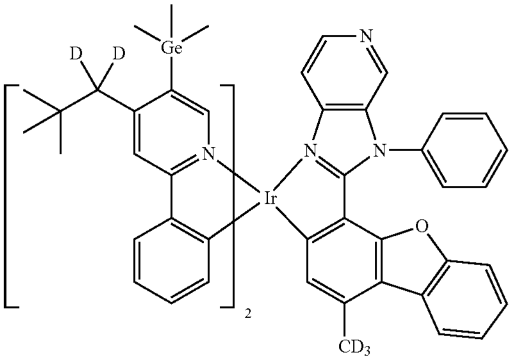

-continued
1935
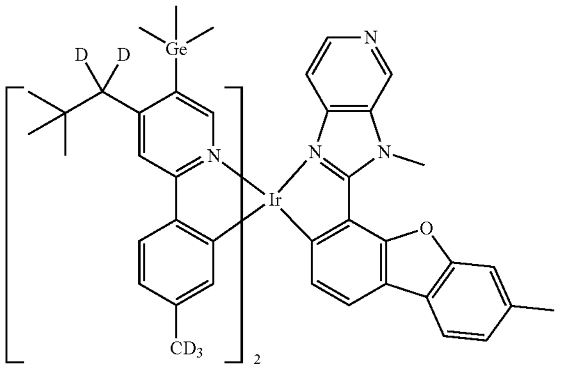
1936
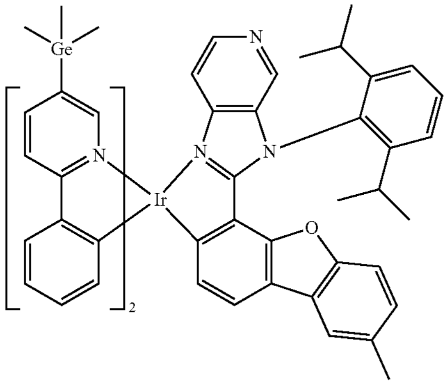
1937
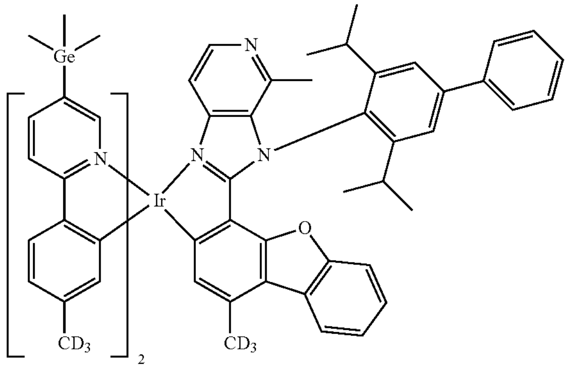
1938
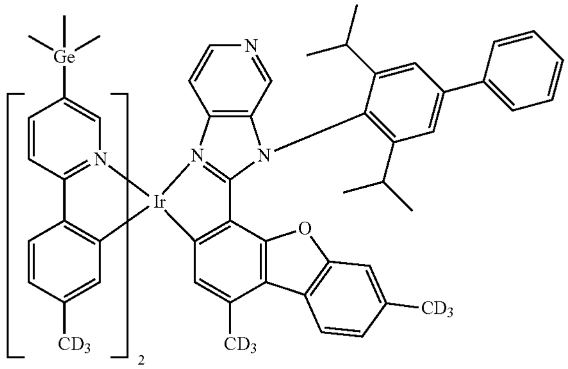
-continued
1939
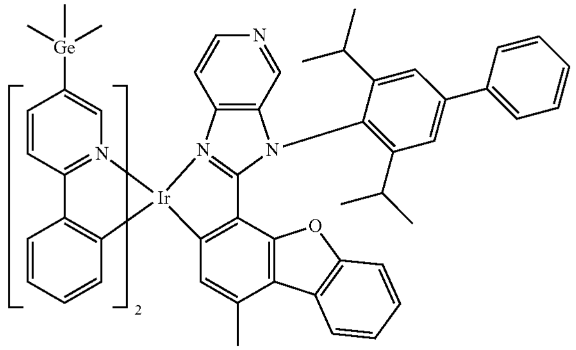
1940
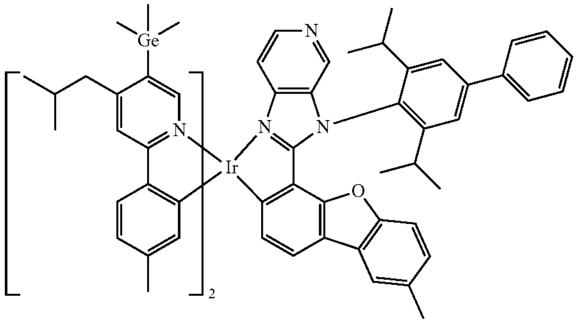
1941
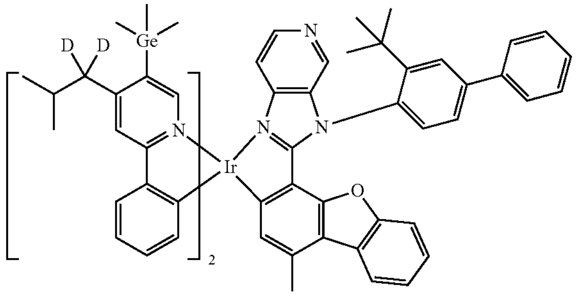
1942
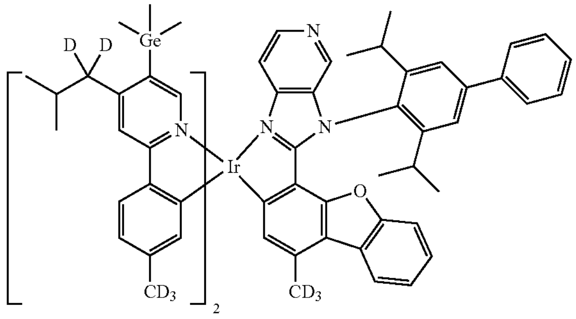

-continued
1943
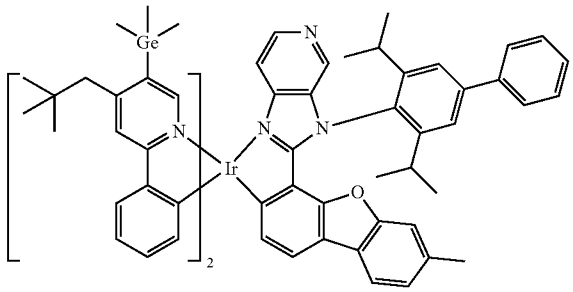
1944
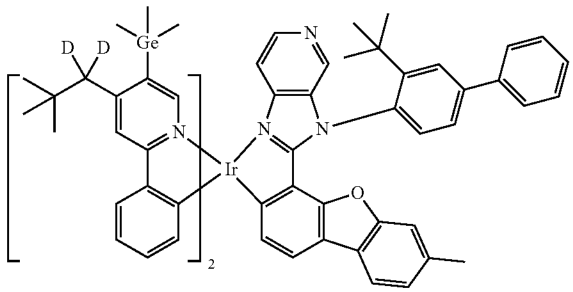
1945
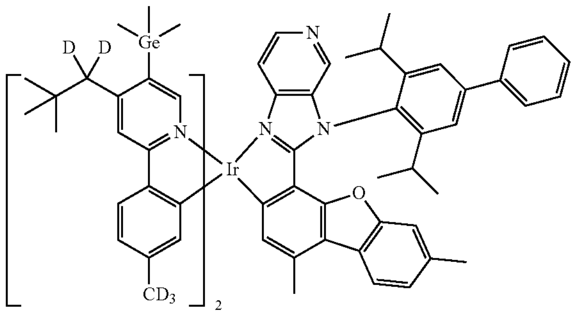
1946
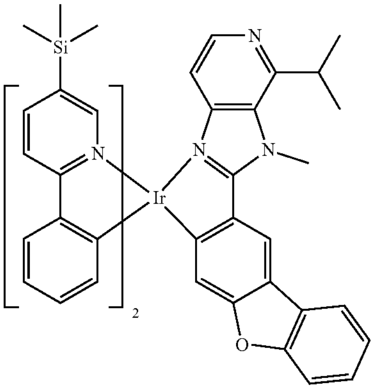
-continued
1947
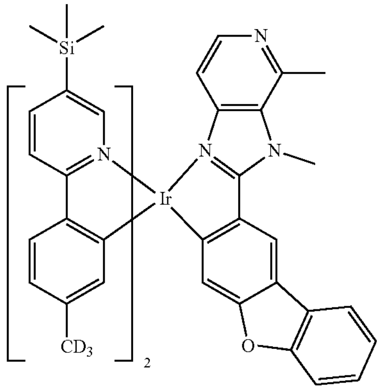
1948
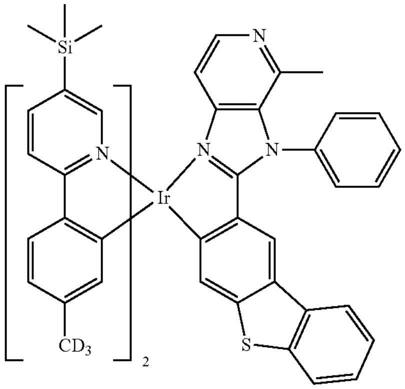
1949
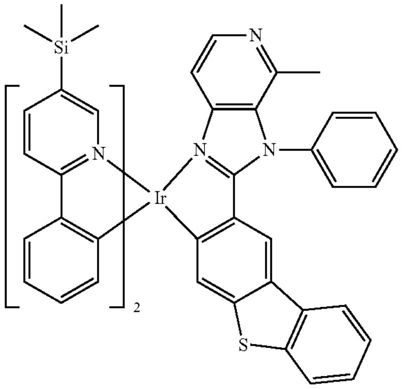
1950
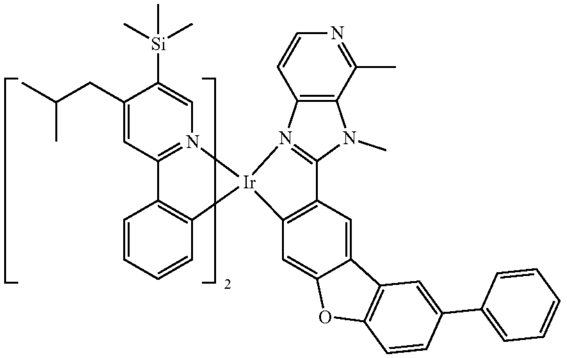

-continued
1951
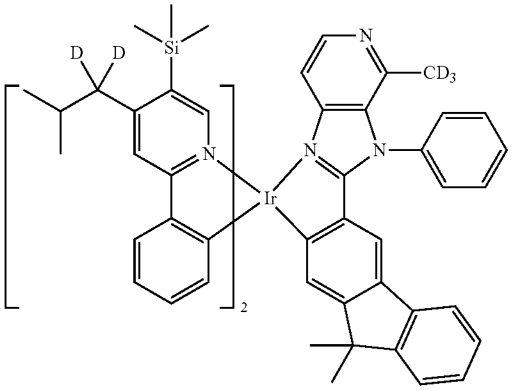
1952
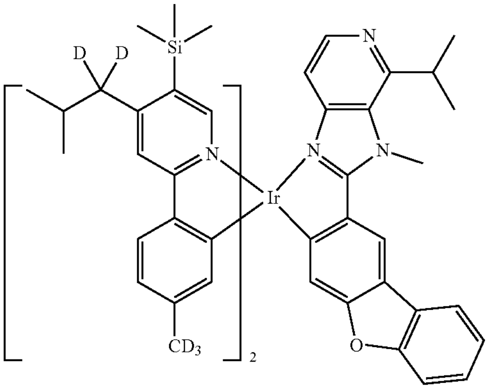
1953
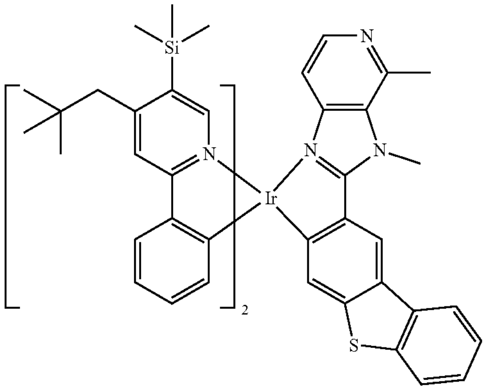
1954
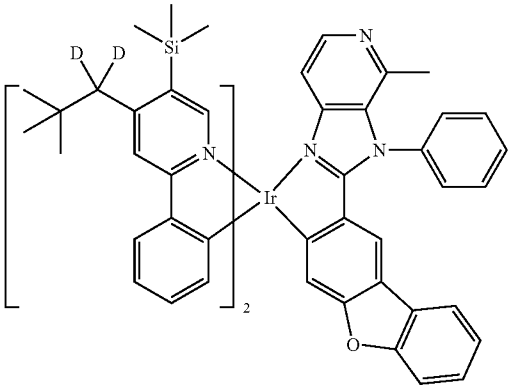
-continued
1955
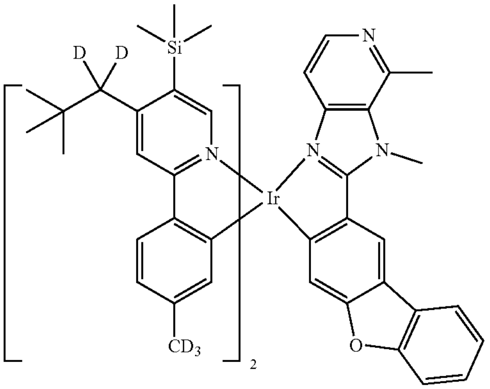
1956
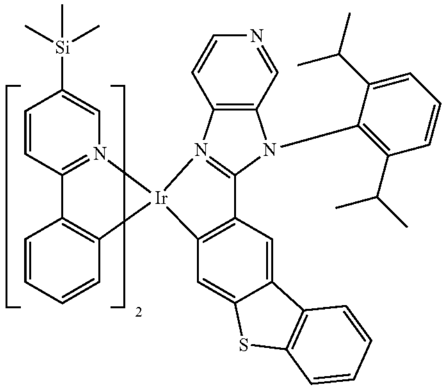
1957
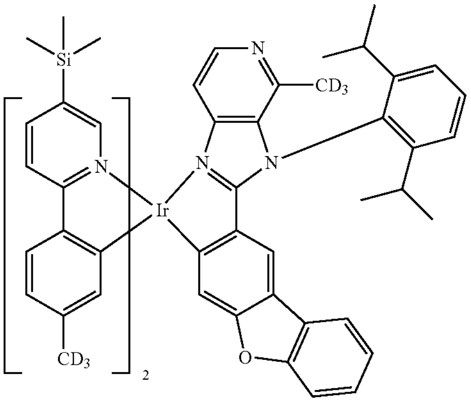
1958
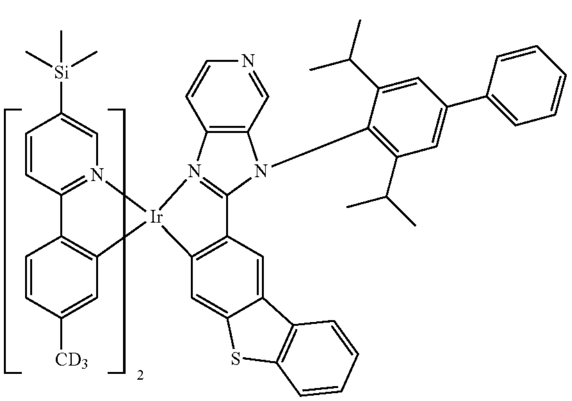

-continued
1959
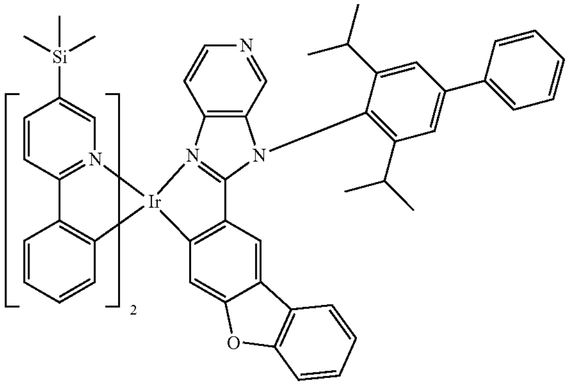
1960
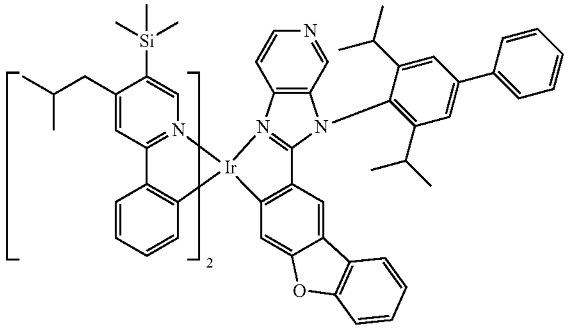
1961
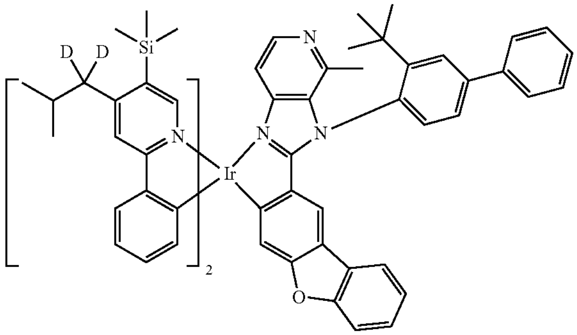
1962
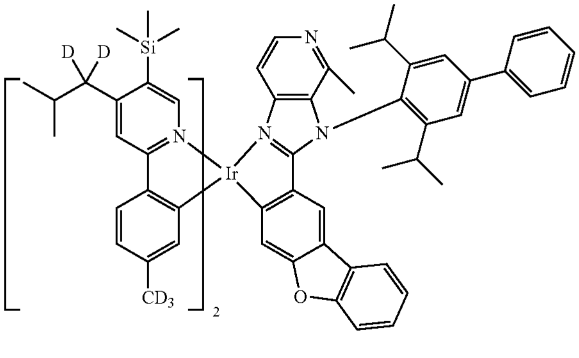
1963
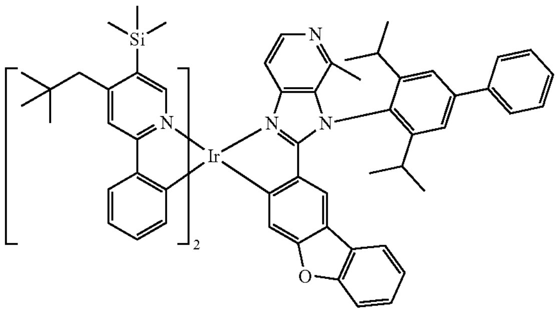
1964
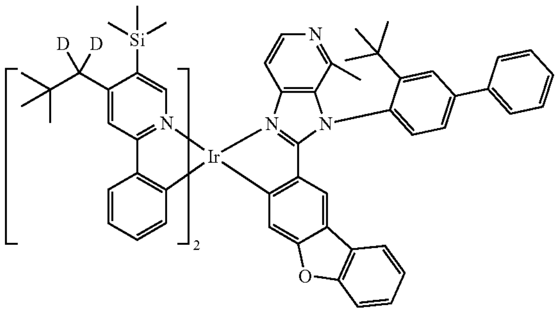
1965
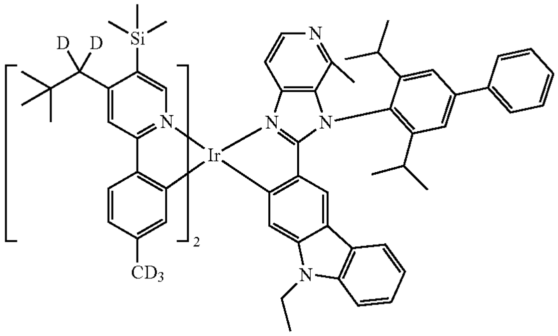
1966
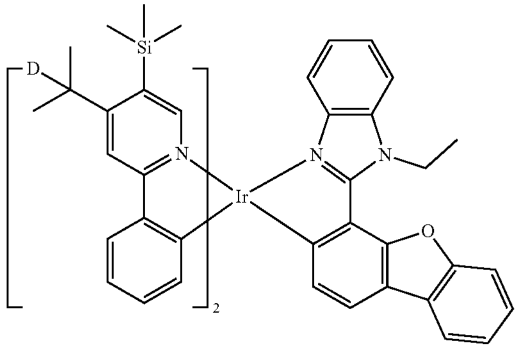

-continued
1967
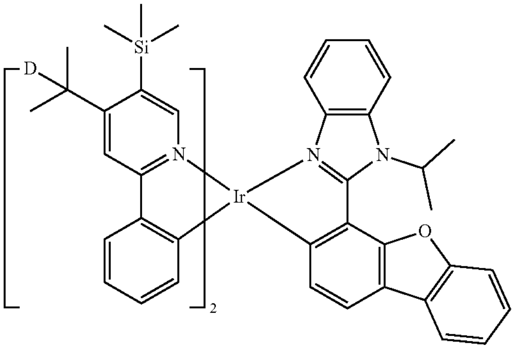
1968
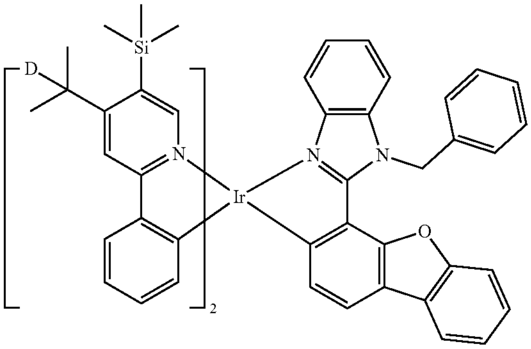
1969
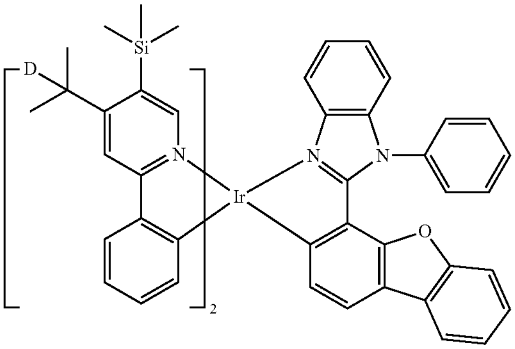
1970
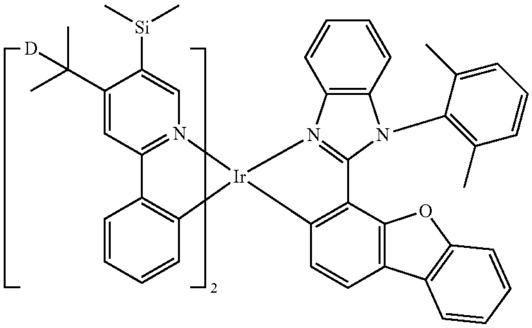
-continued
1971
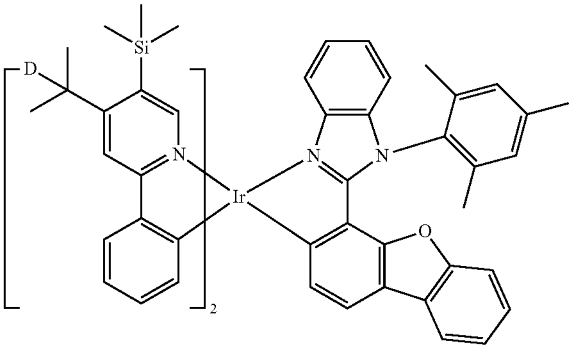
1972
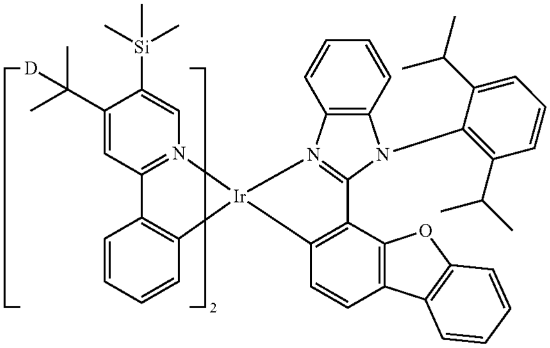
1973
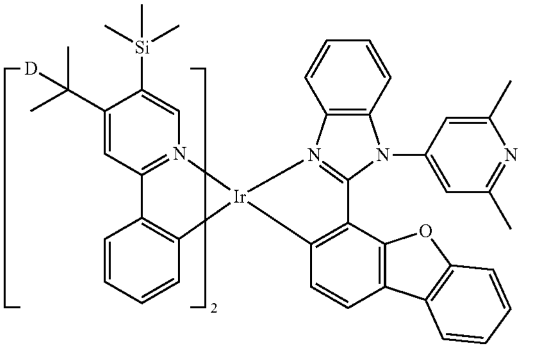
1974
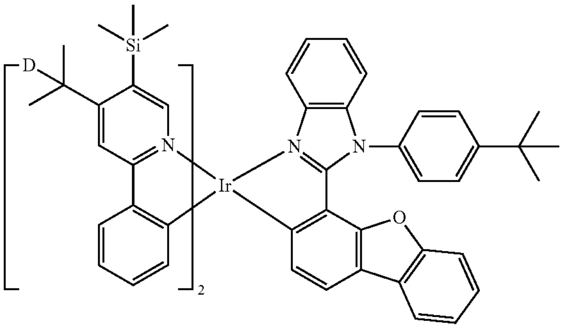

-continued
1975
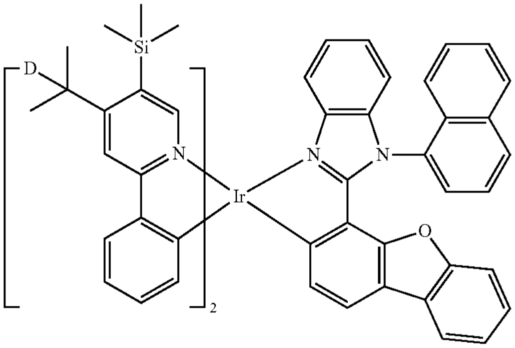
1976
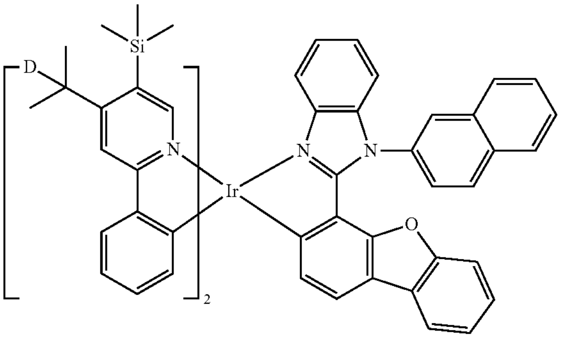
1977
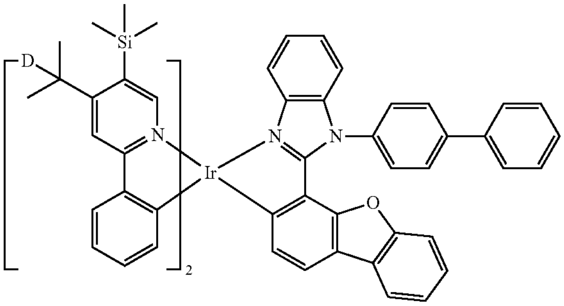
1978
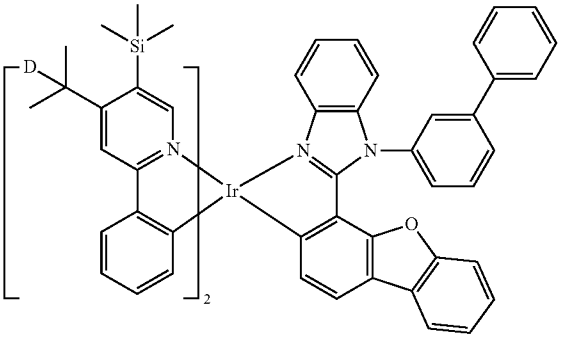
-continued
1979
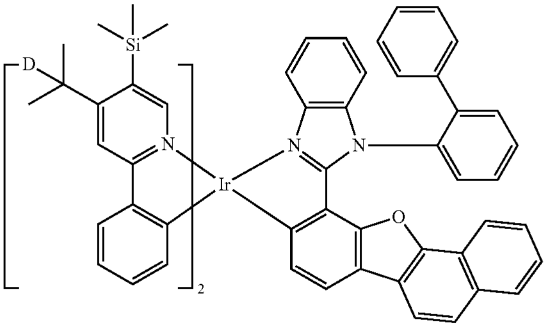
1980
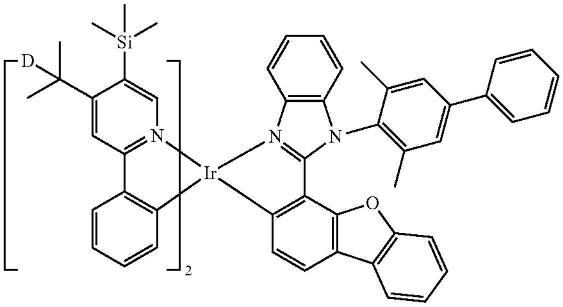
1981
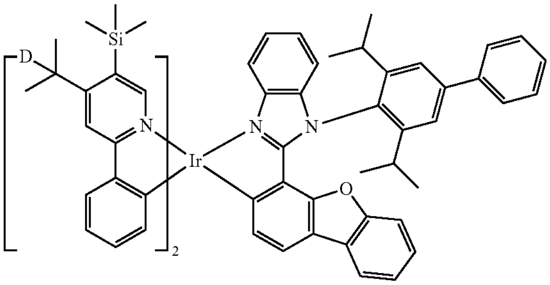
1982
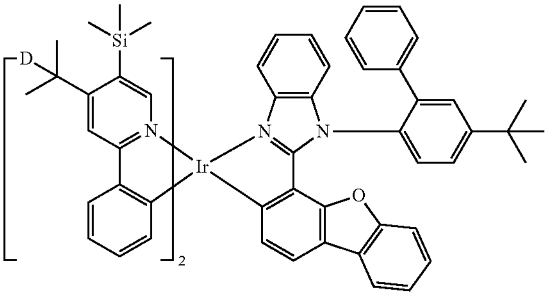

-continued
1983
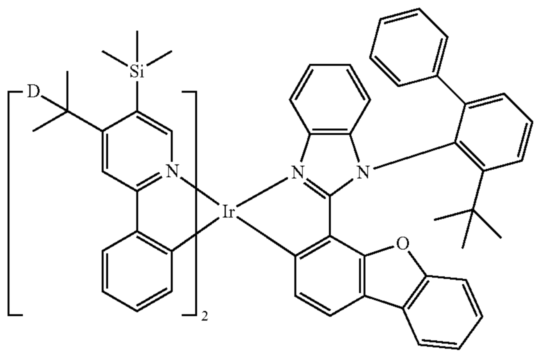
1984
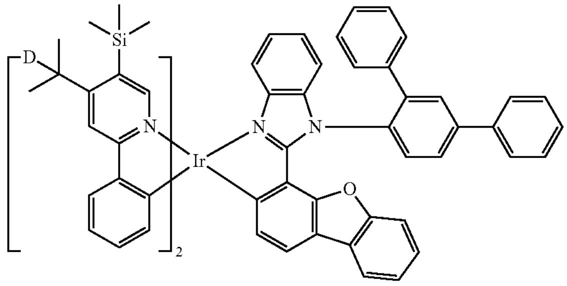
1985
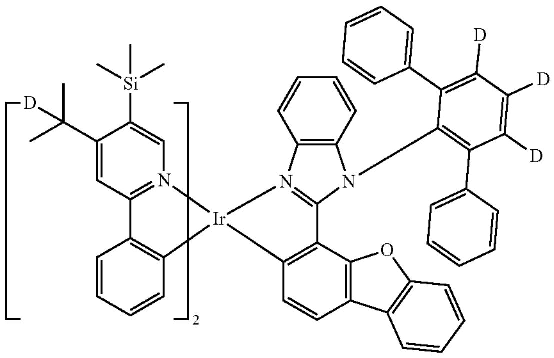
1986
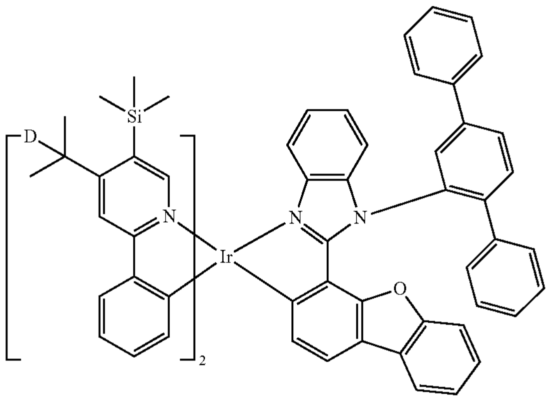
-continued
1987
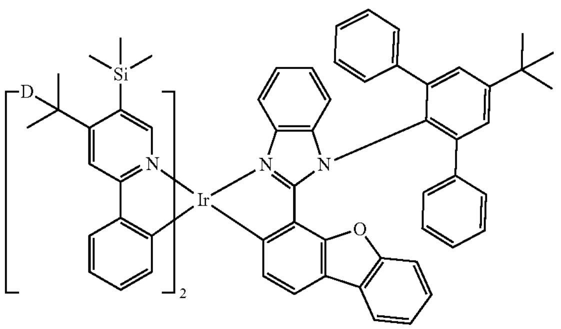
1988
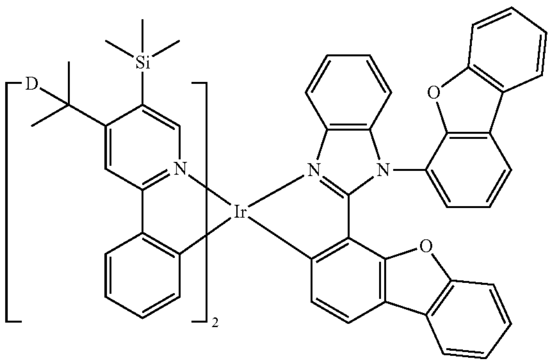
1989
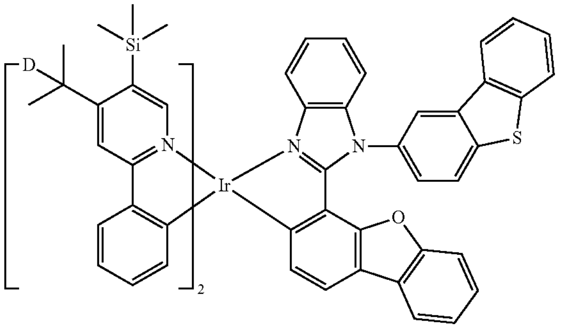
1990
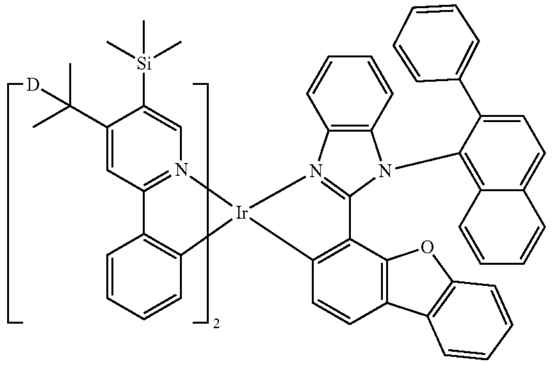

-continued
1991
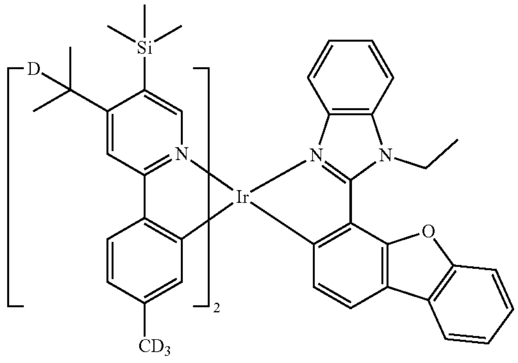
1992
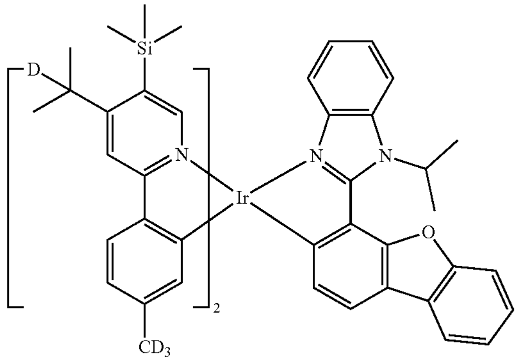
1993
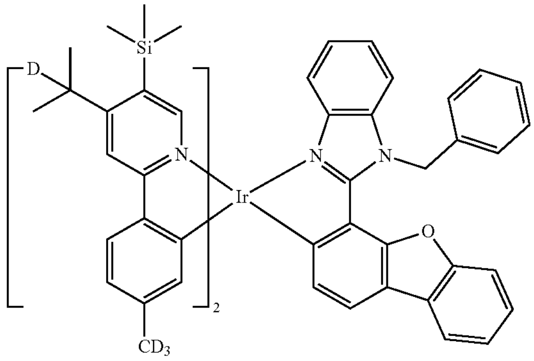
1994
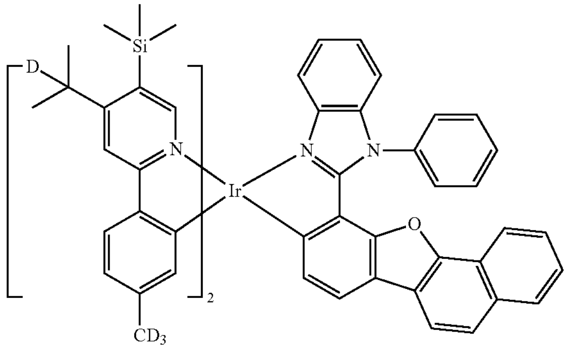
-continued
1995
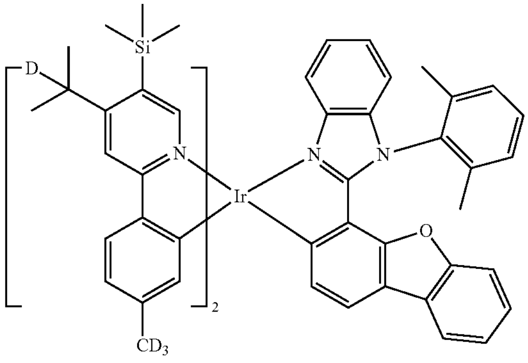
1996
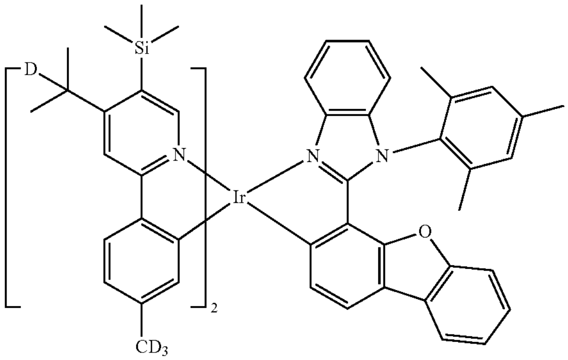
1997
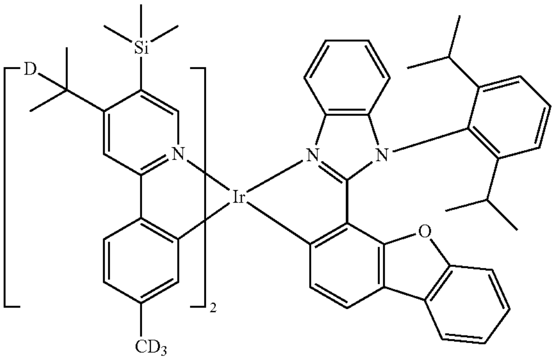
1998
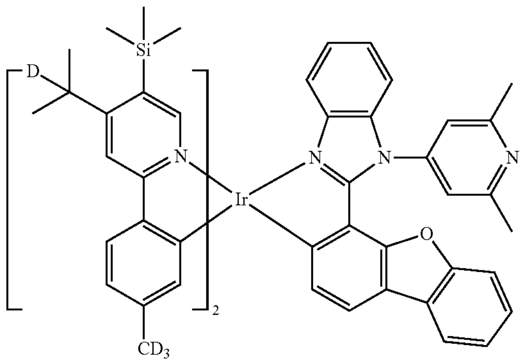

-continued
2999
1999
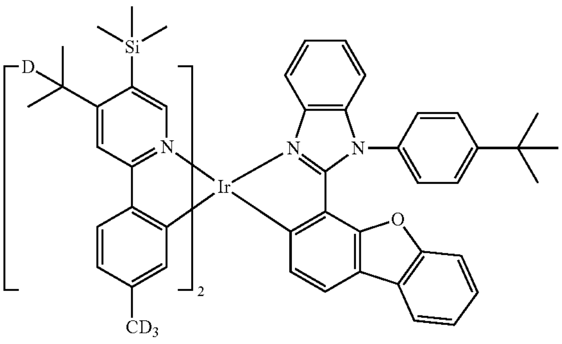
2000
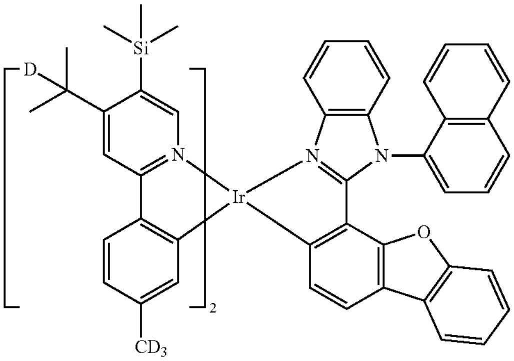
2001
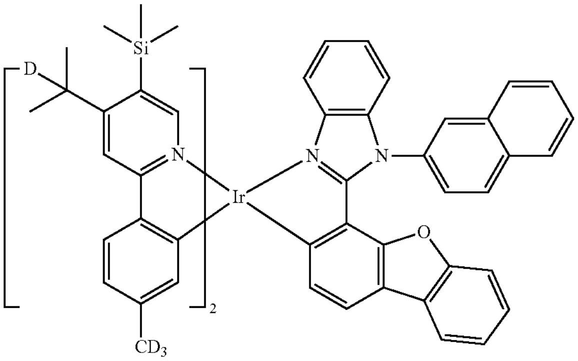
2002
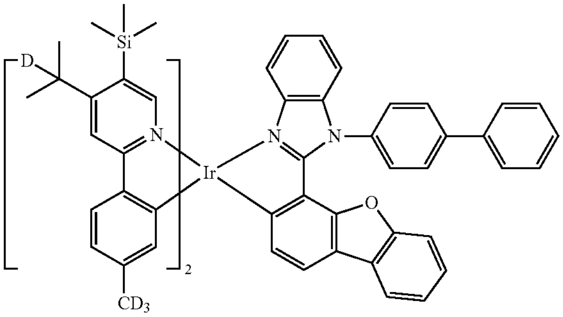
-continued
2003
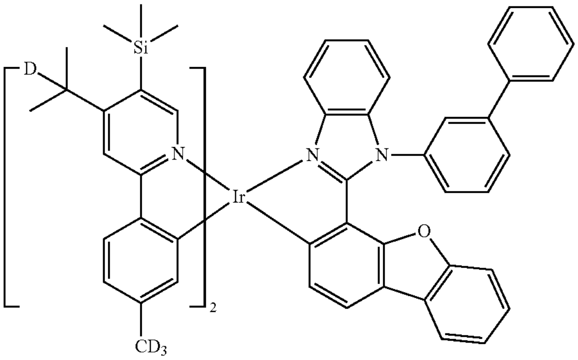
2004
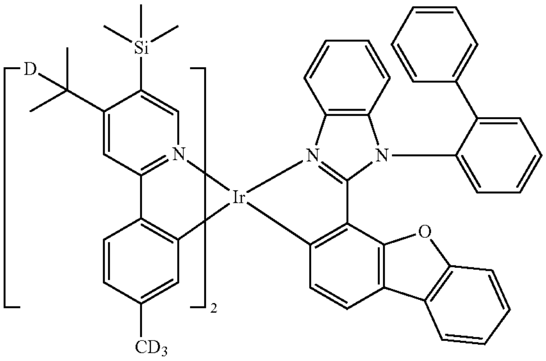
2005
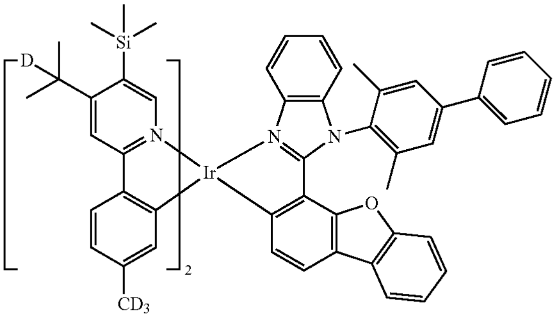
2006
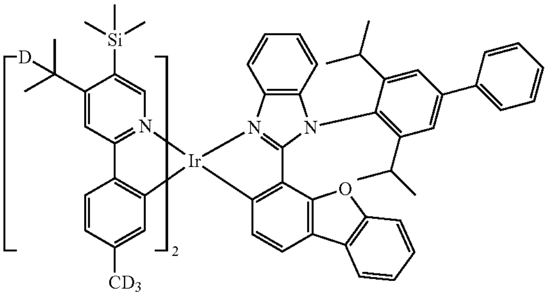

-continued
2007
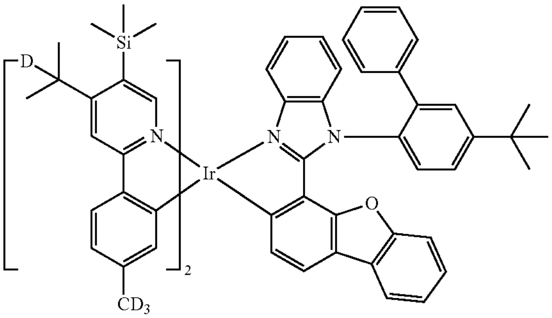
2008
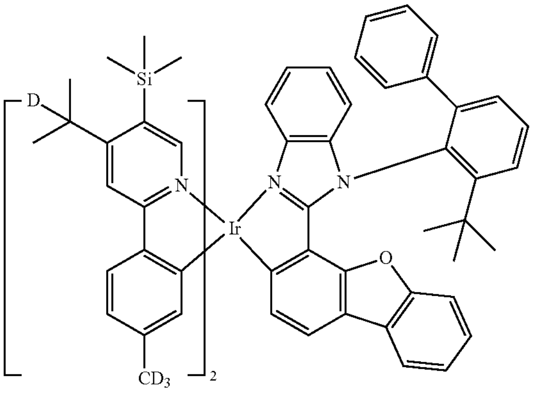
2009
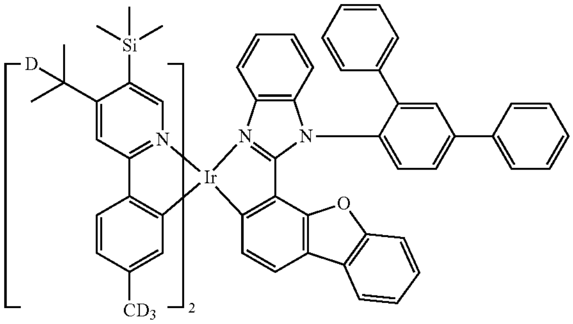
2010
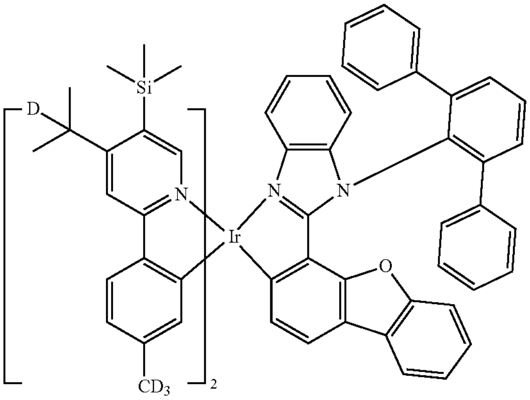
-continued
2011
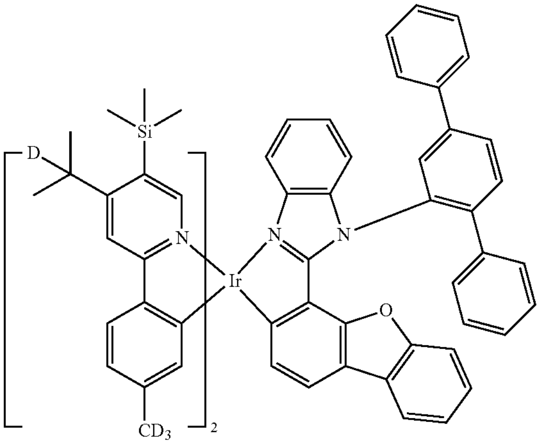
2012
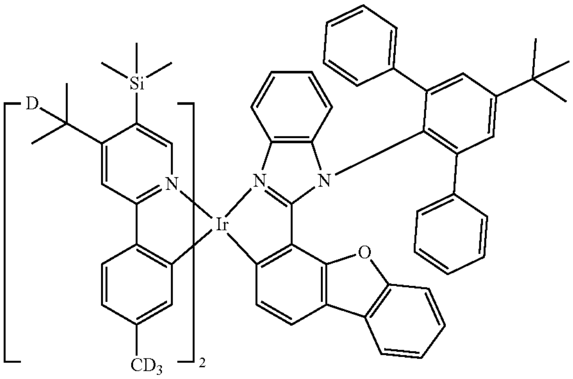
2013
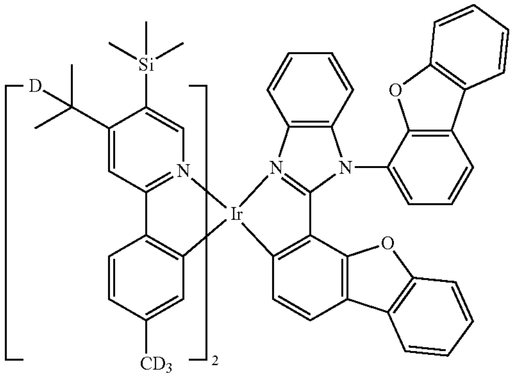
2014
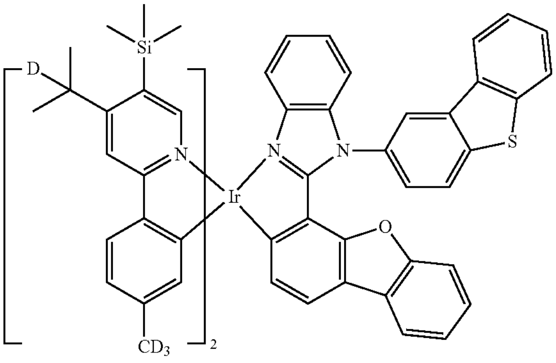

-continued
2015
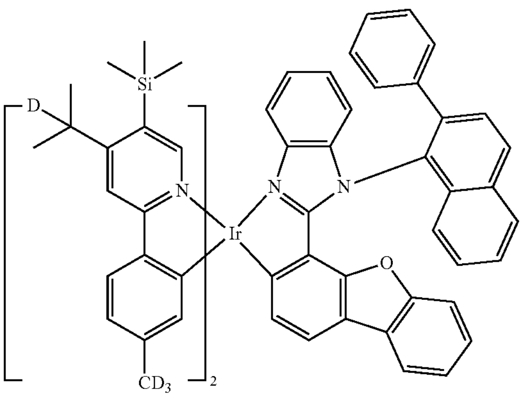
2016
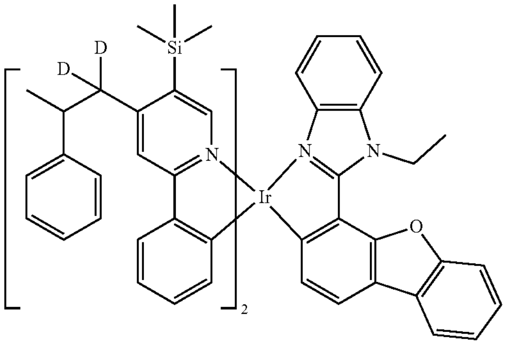
2017
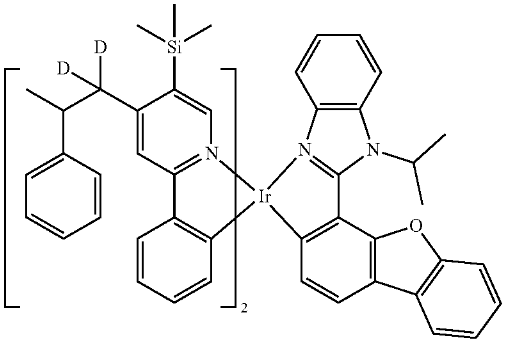
2018
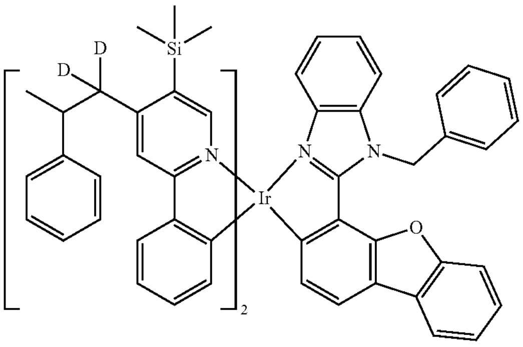
-continued
2019
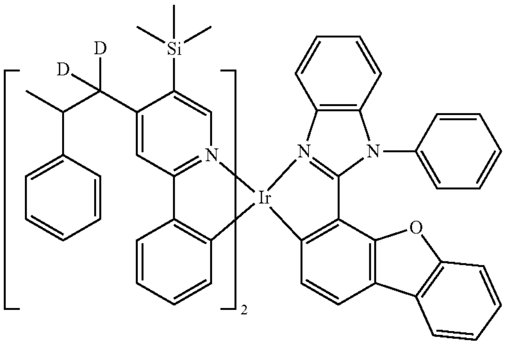
2020
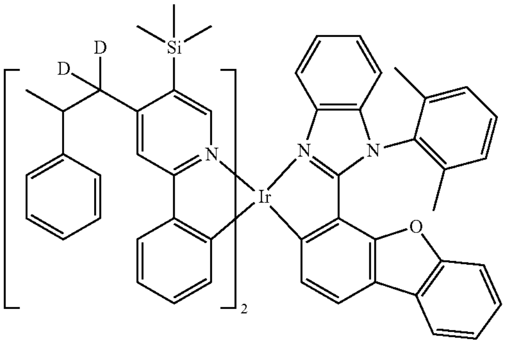
2021
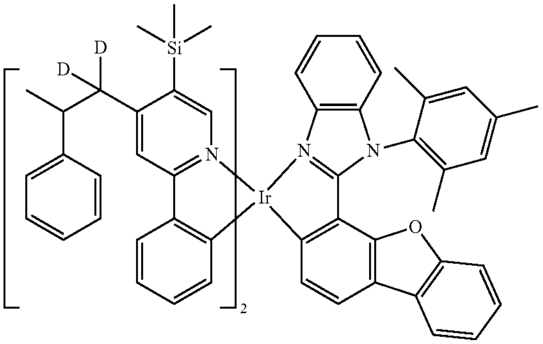
2022
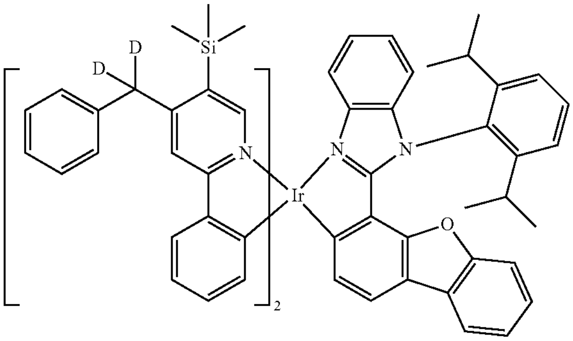

2023
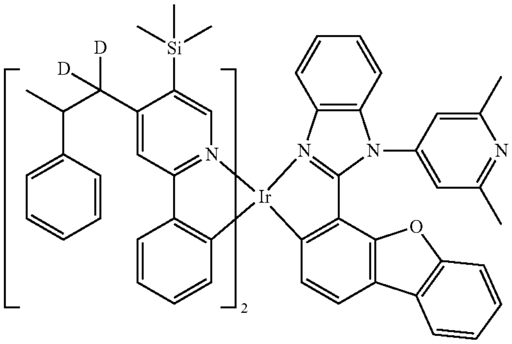
2024
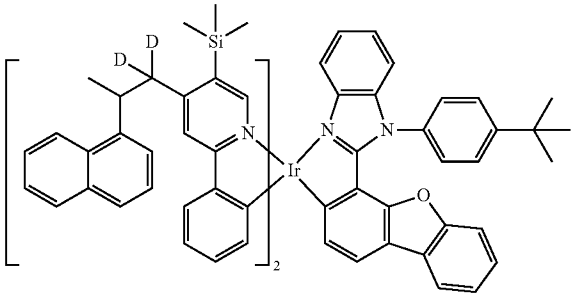
2025
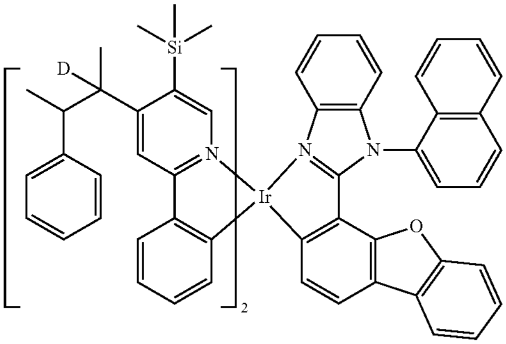
2026
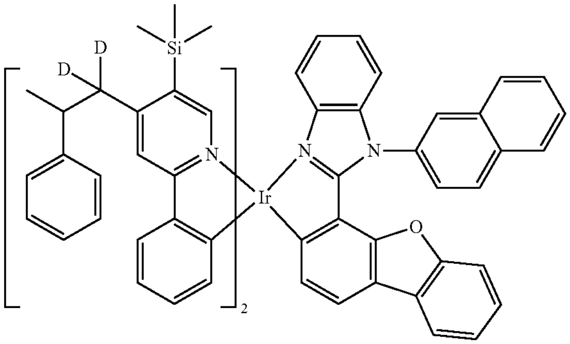
2027
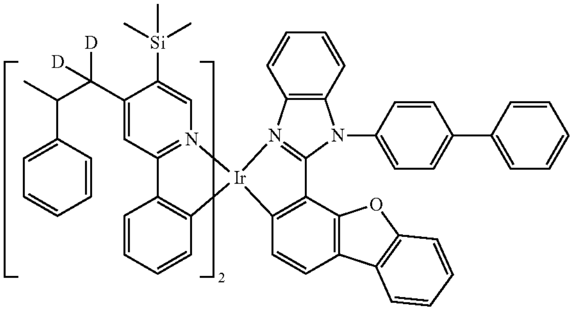
2028
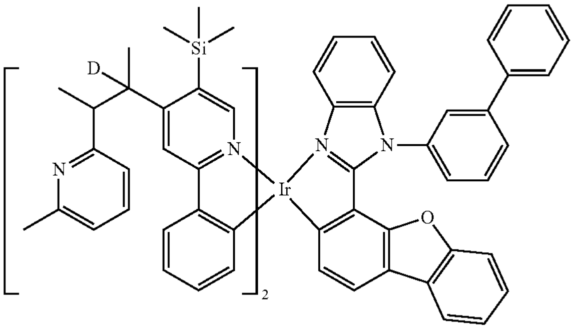
2029
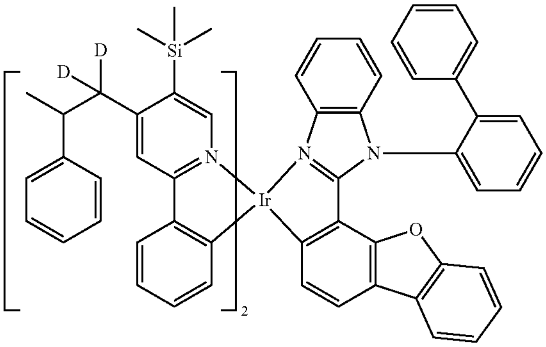
2030
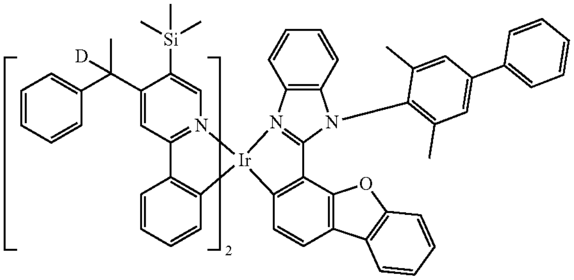

-continued
2031
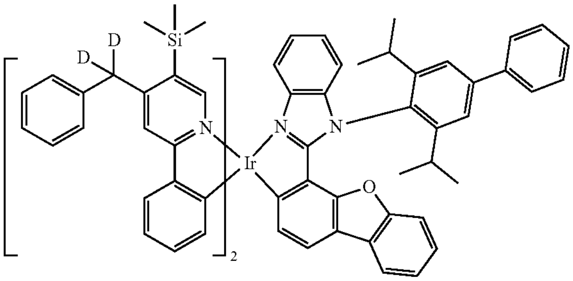
2032
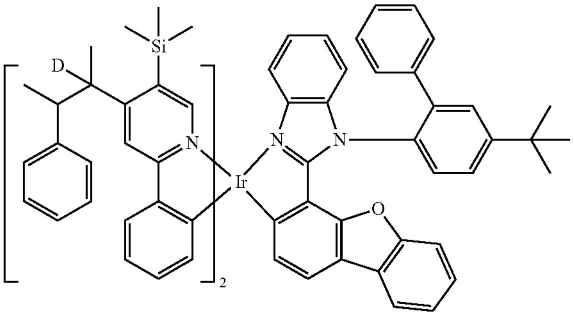
2033
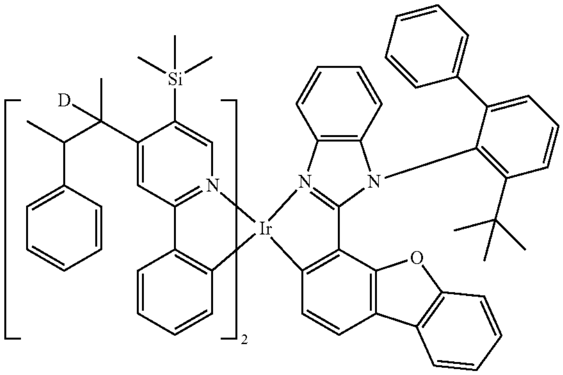
2034
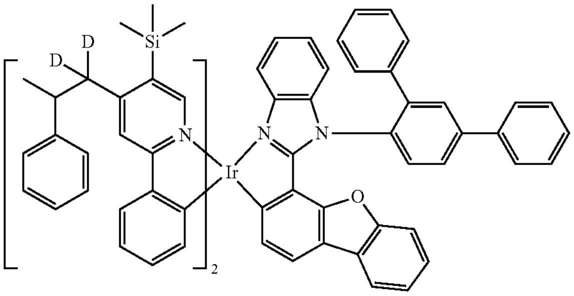
-continued
2035
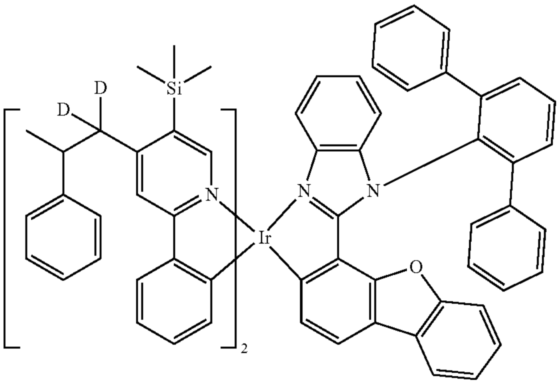
2036
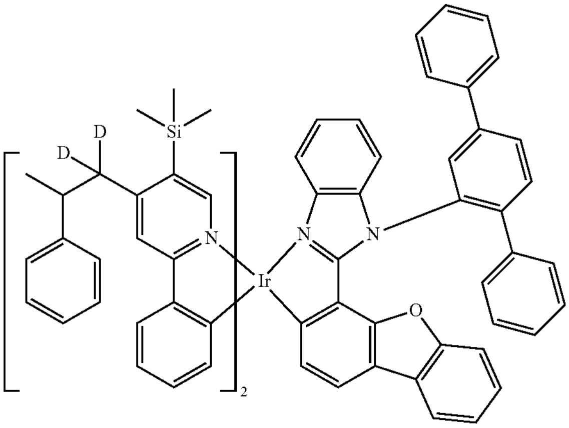
2037
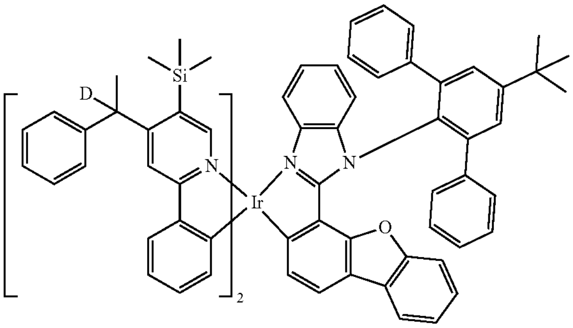
2038
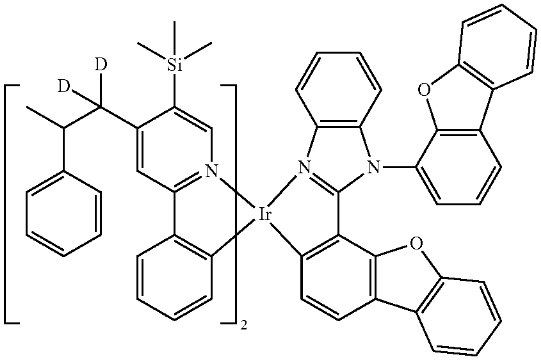

-continued
2038
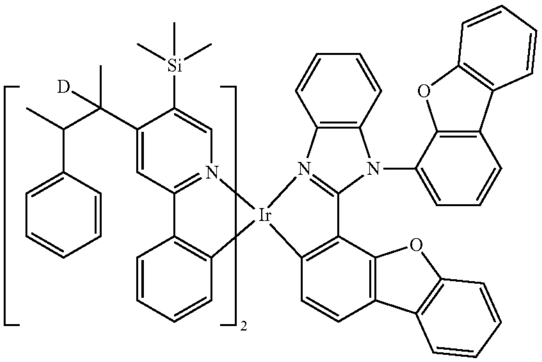
2039
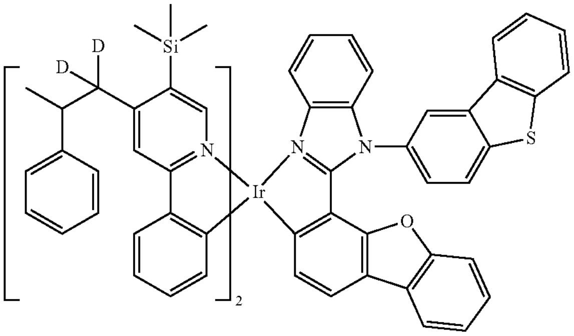
2040
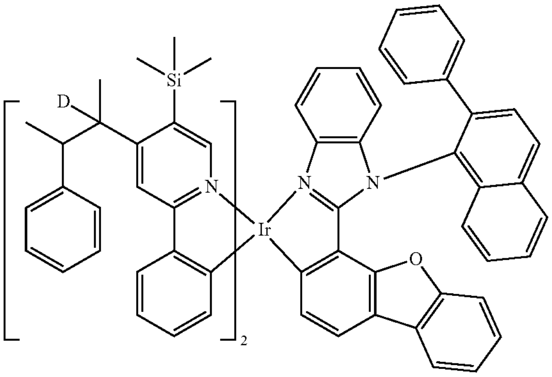
2041
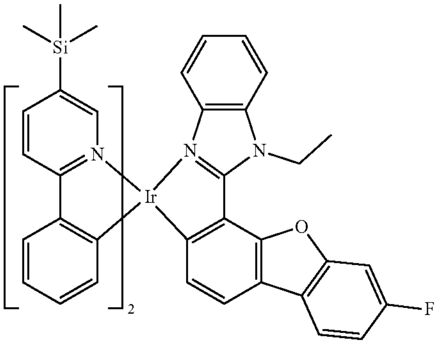
-continued
2042
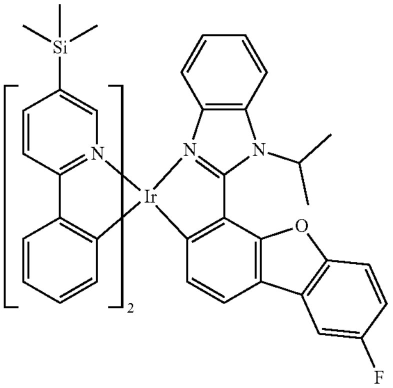
2043
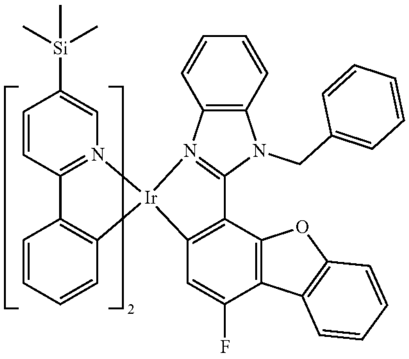
2044
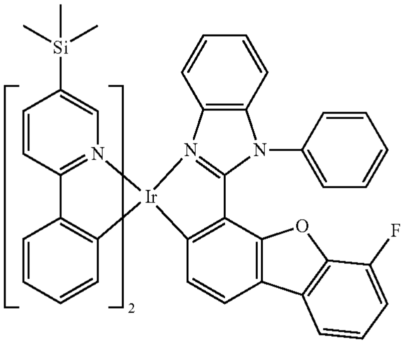
2045
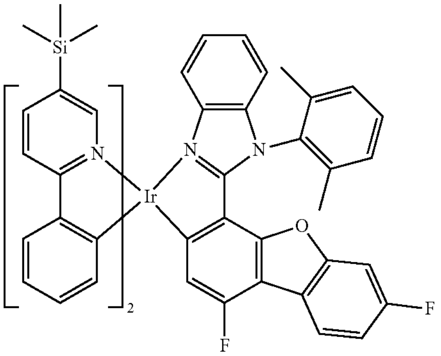

-continued
2046
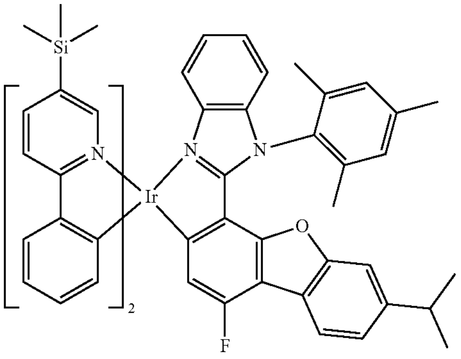
2047
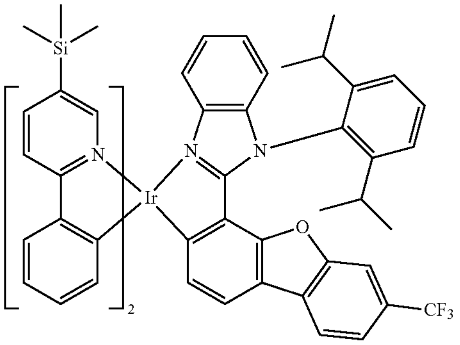
2048
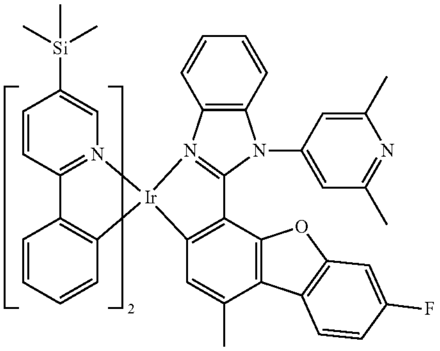
2049
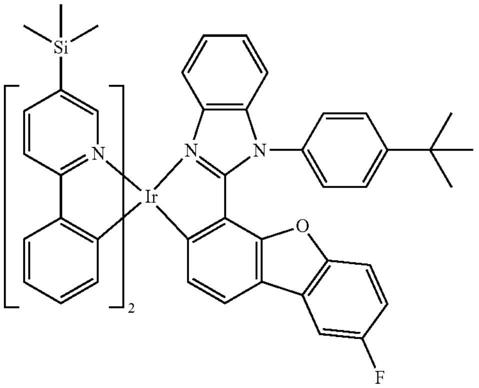
-continued
2050
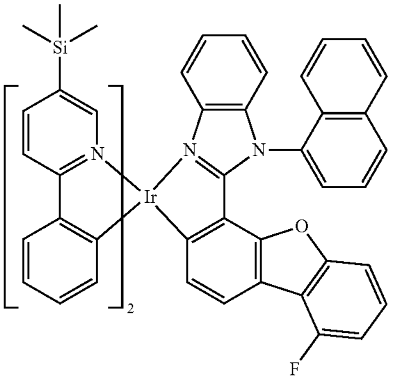
2051
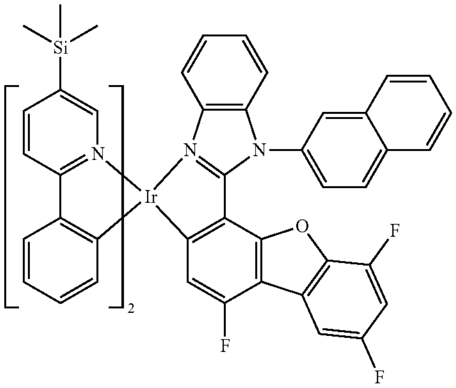
2052
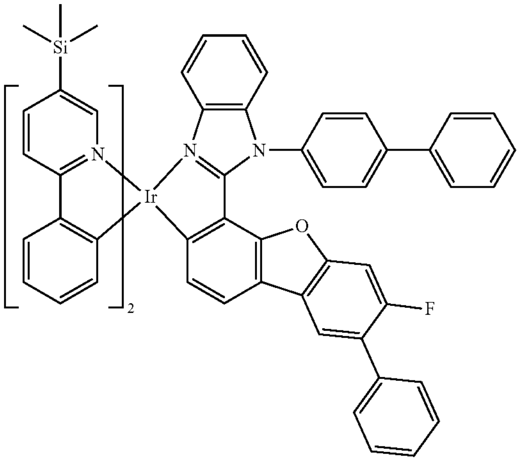

-continued
2053
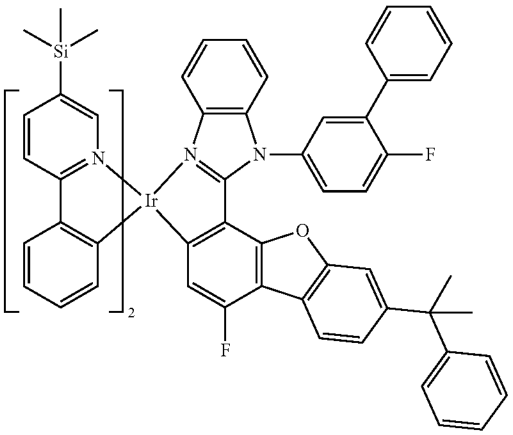
2054
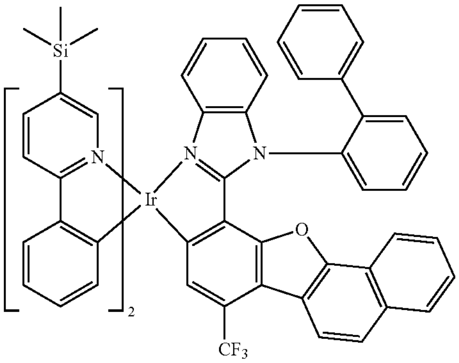
2055
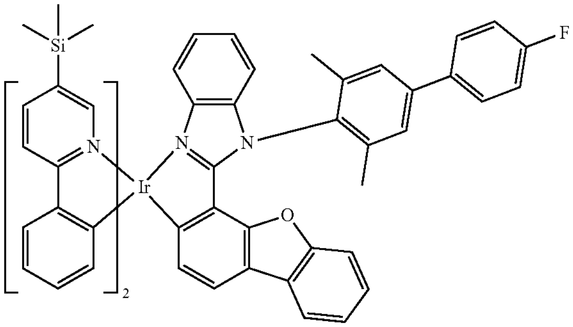
2056
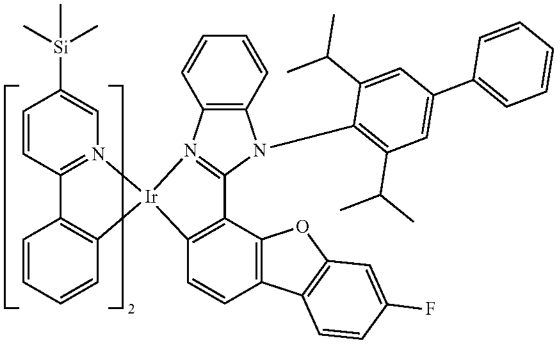
-continued
2057
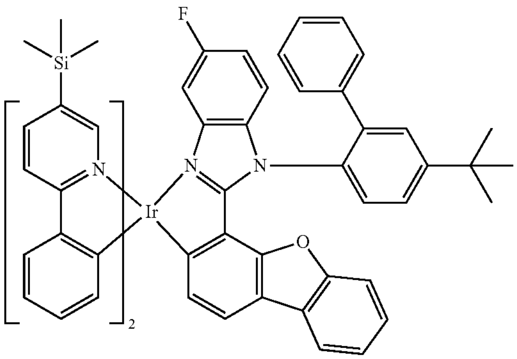
2058
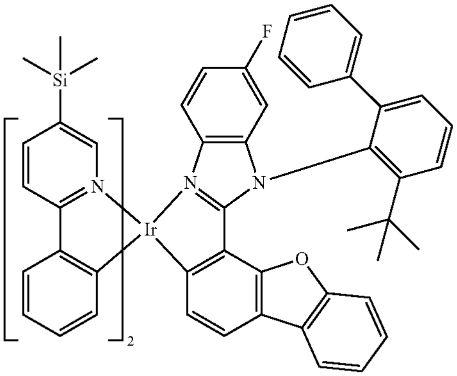
2059
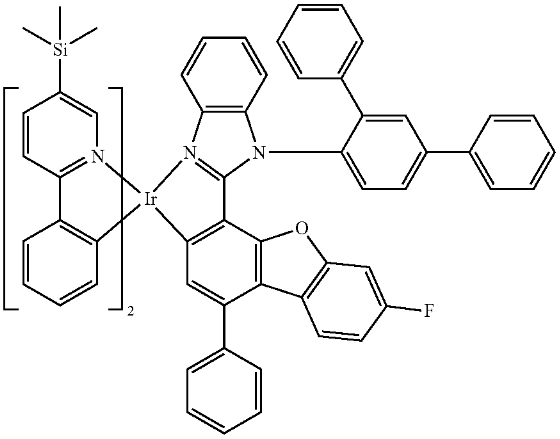
2060
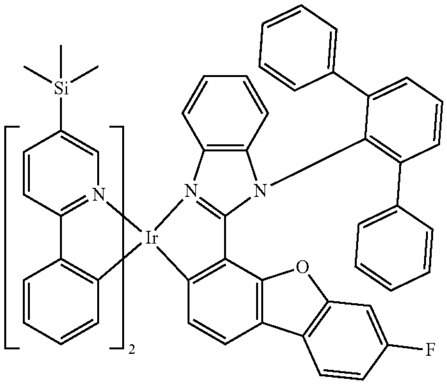

2061
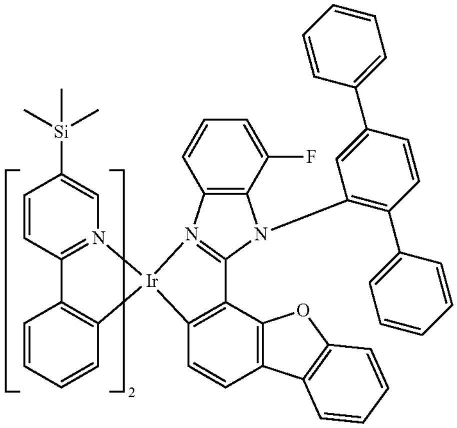
2062
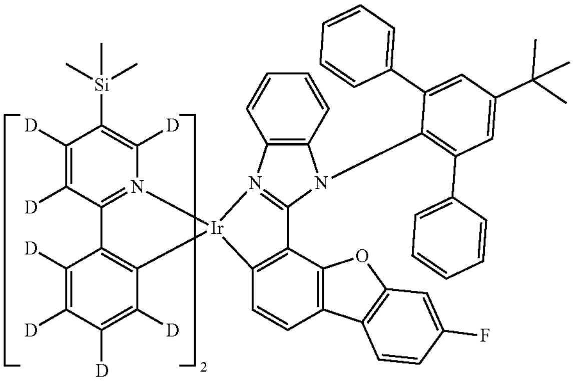
2063
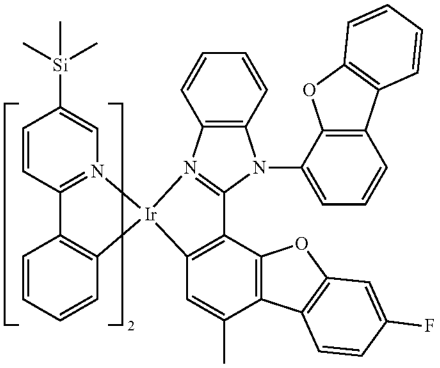
2064
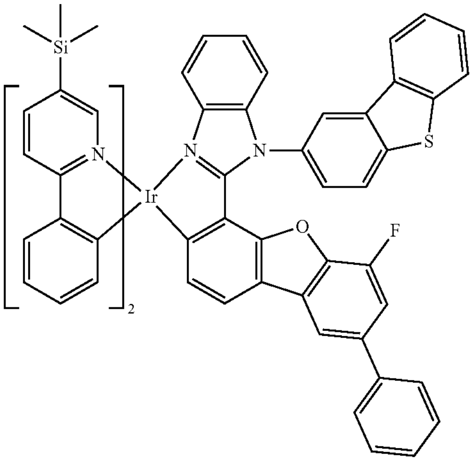
2065
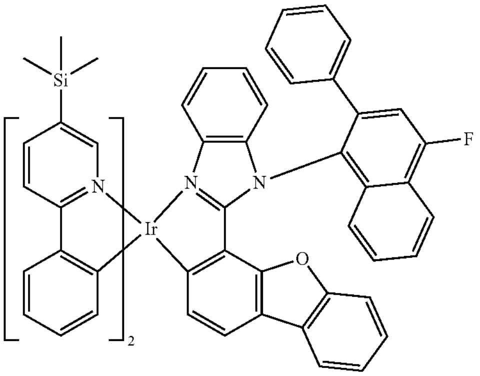
2066
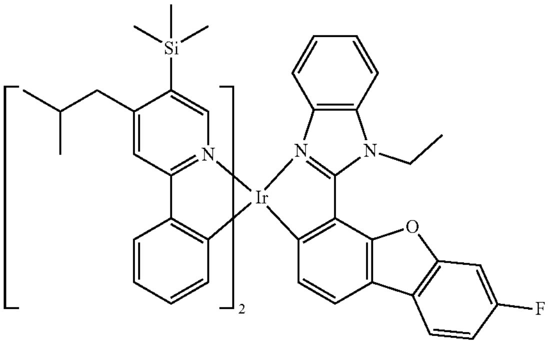
2067
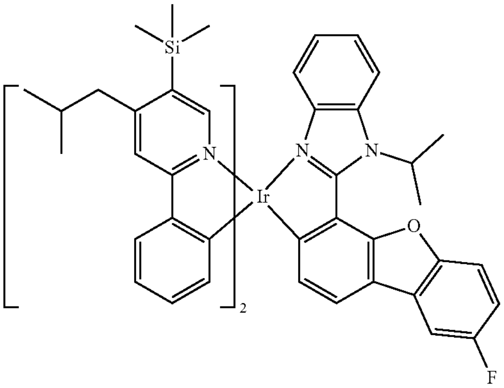

-continued
2068
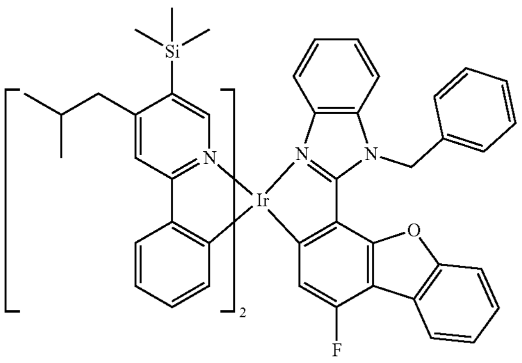
2069
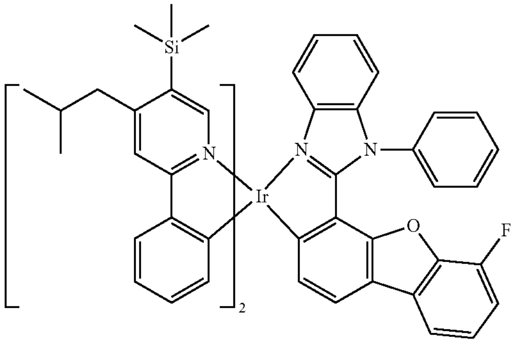
2070
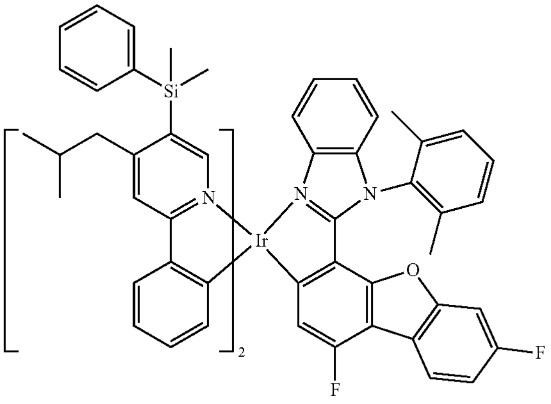
2071
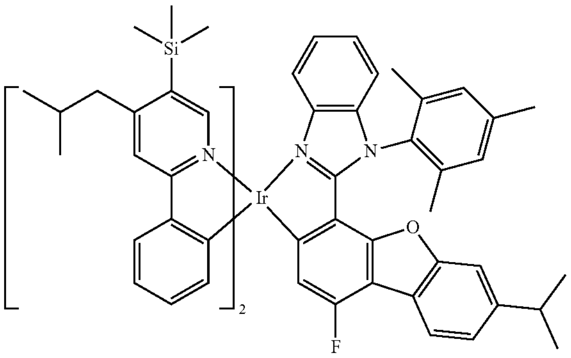
-continued
2072
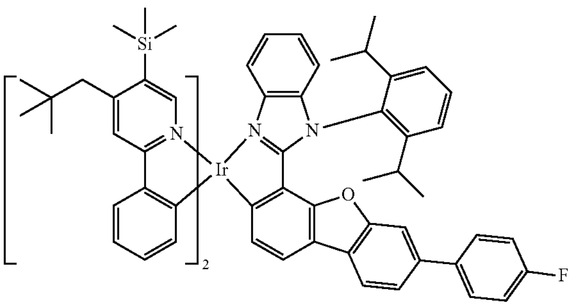
2073
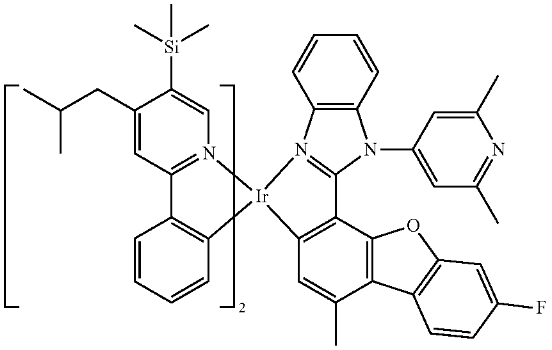
2074
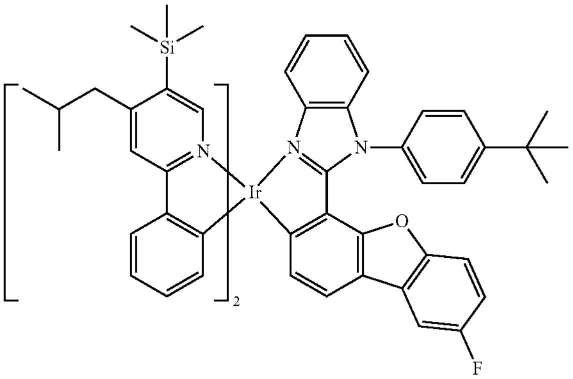
2075
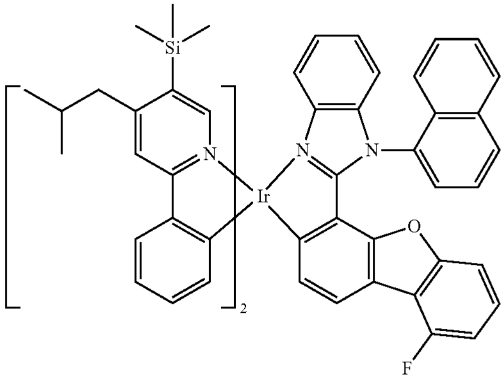

-continued
2076
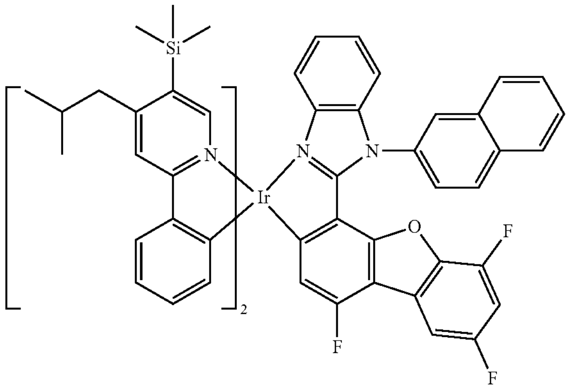
2077
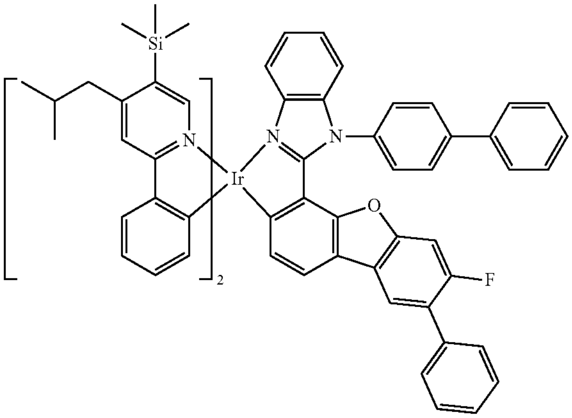
2078
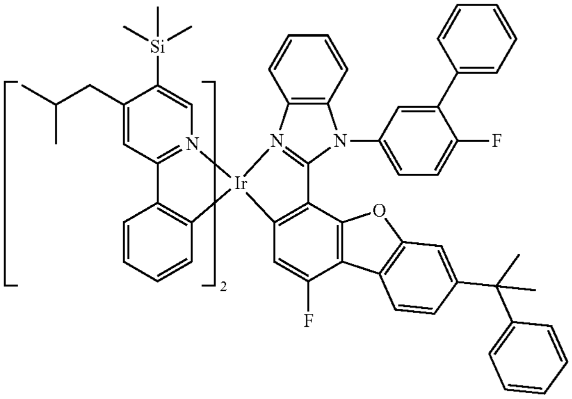
2079
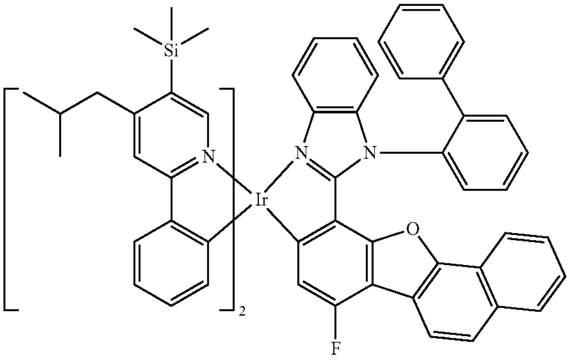
-continued
2080
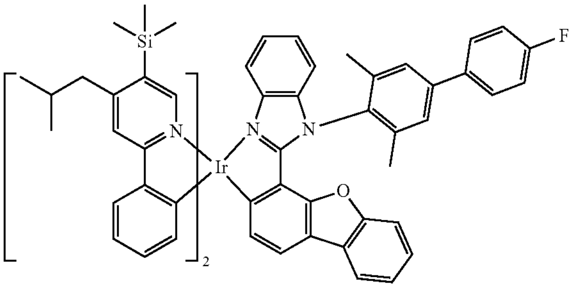
2081
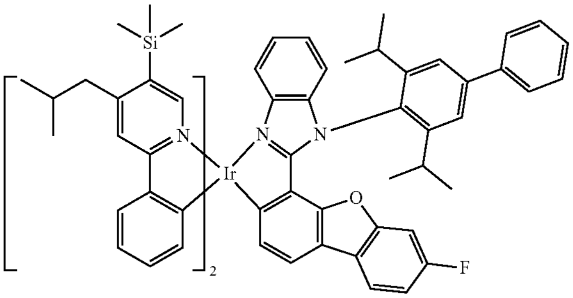
2082
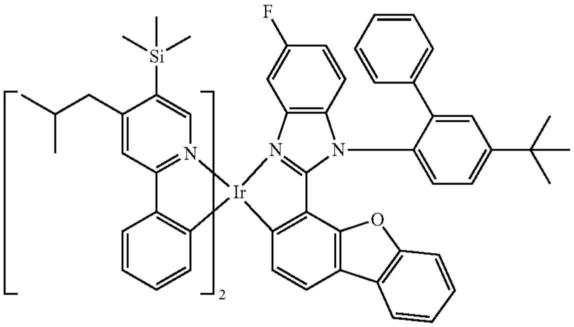
2083
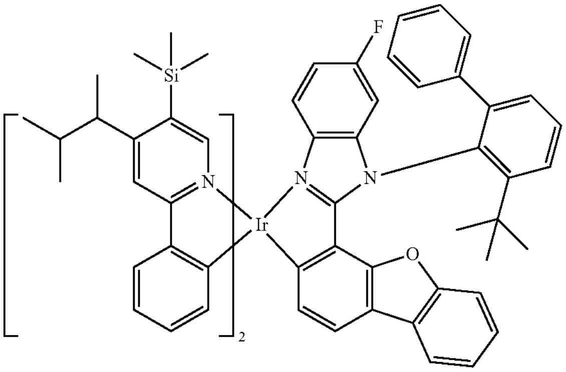

-continued
2084
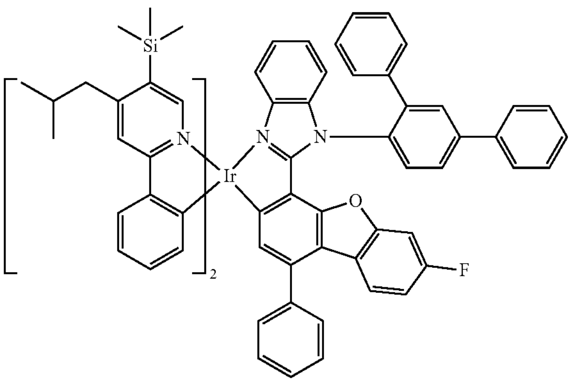
2085
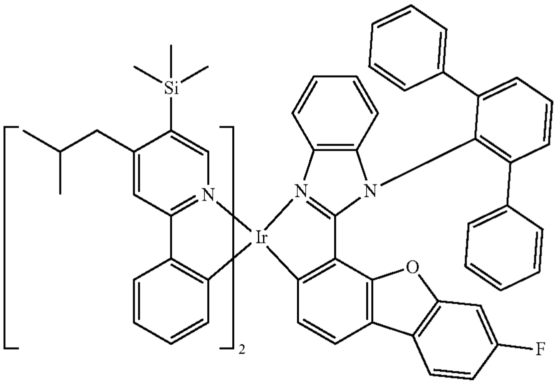
2086
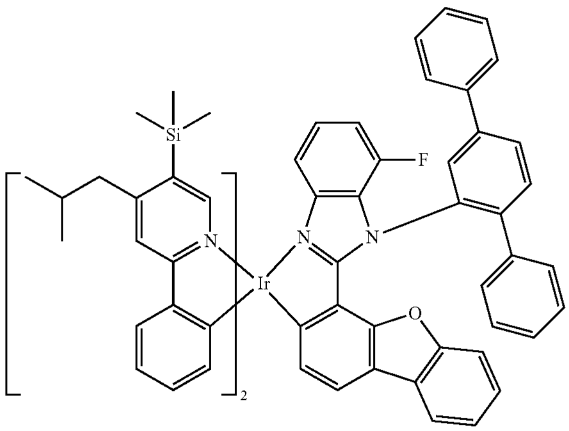
2087
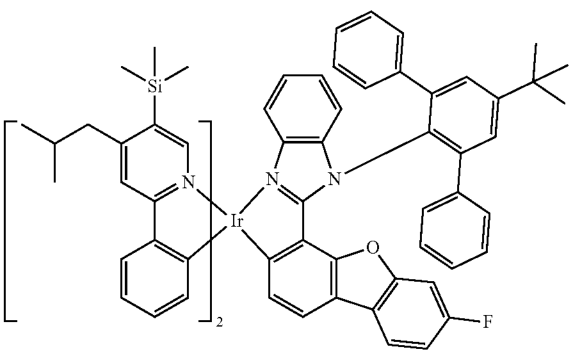
-continued
2088
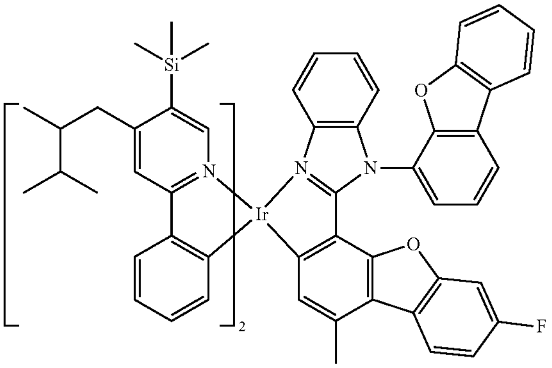
2089
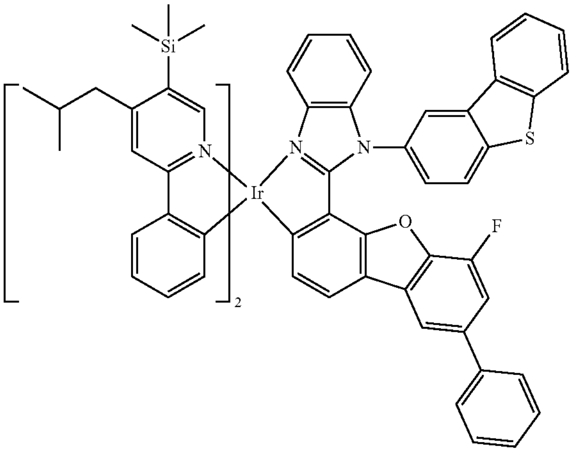
2090
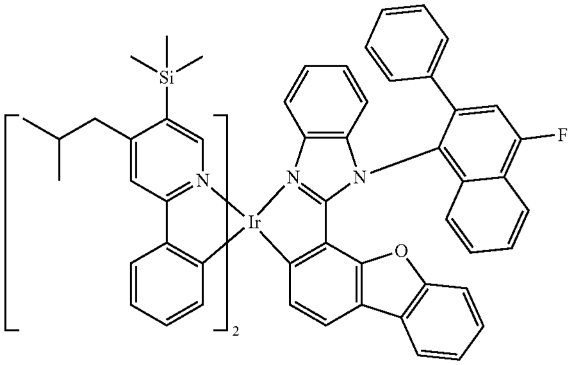

2091
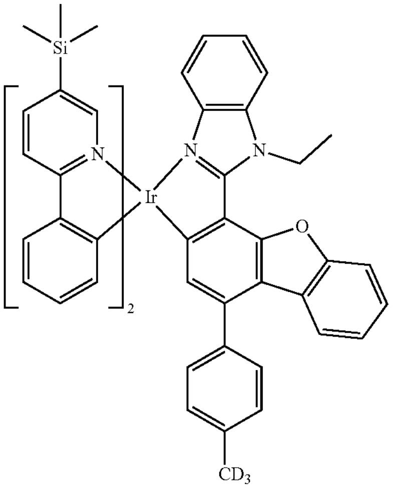
2092
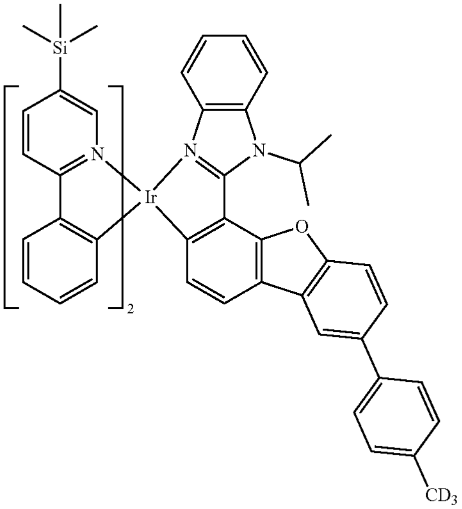
2093
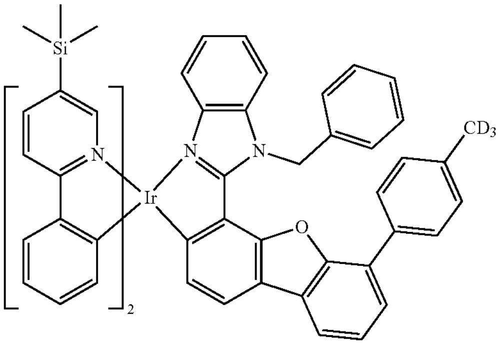
2094
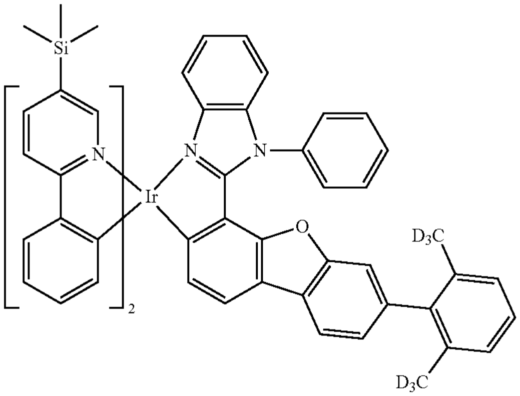
2095
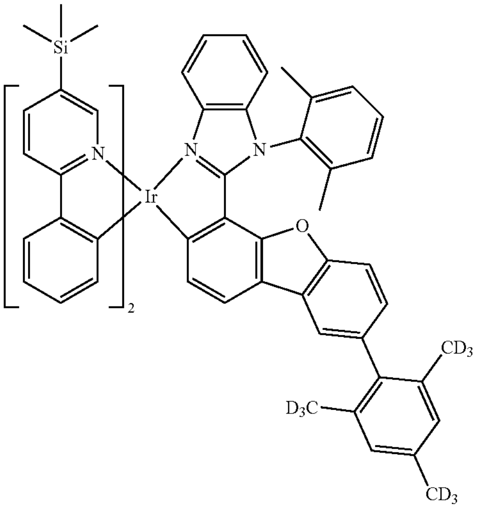
2096
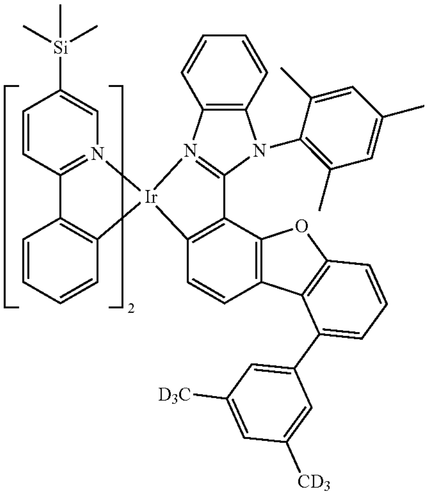

-continued
2097
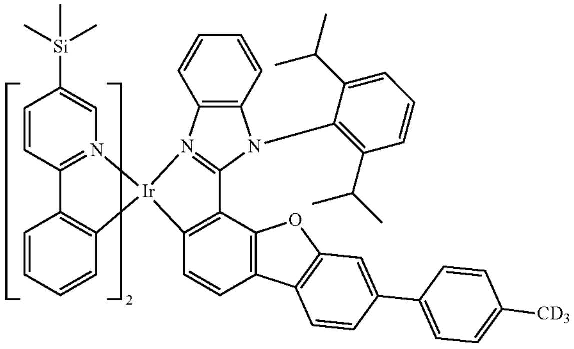
2098
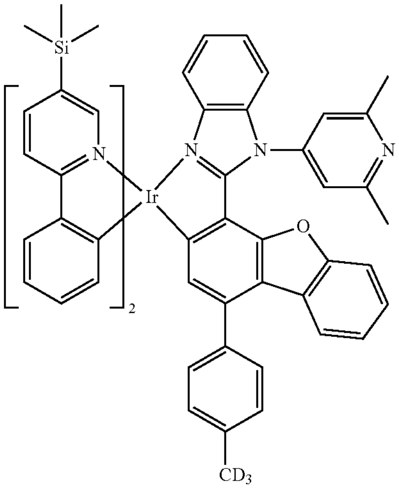
2099
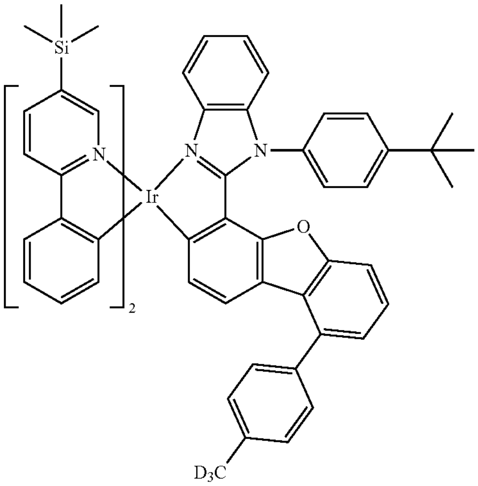
-continued
2100
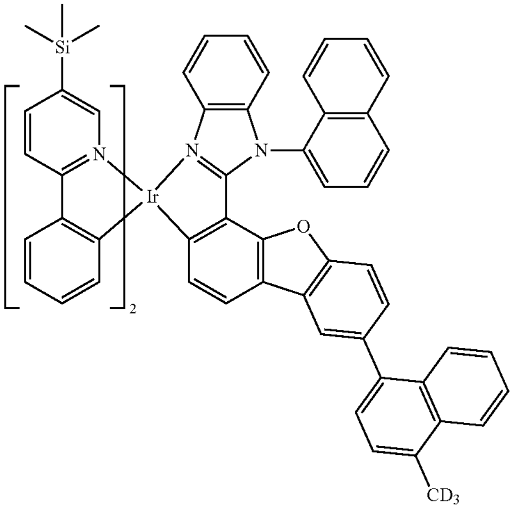
2101
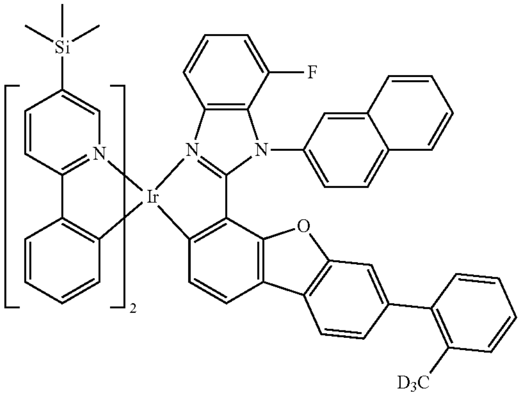
2102
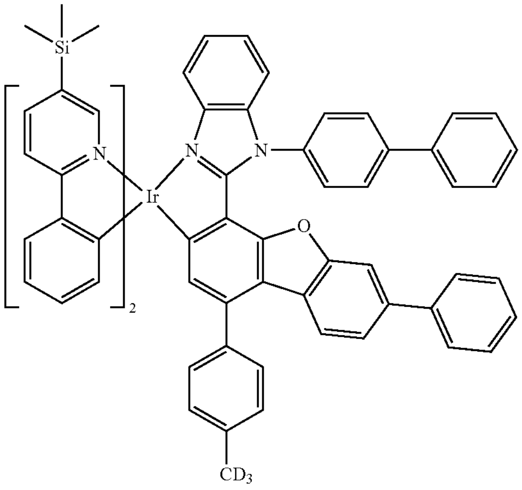

-continued
2103
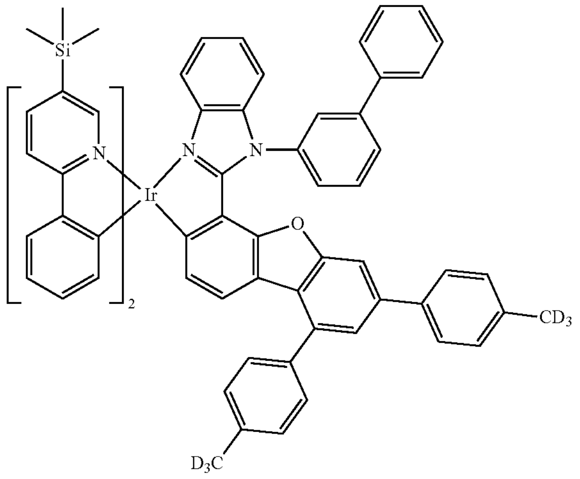
2104
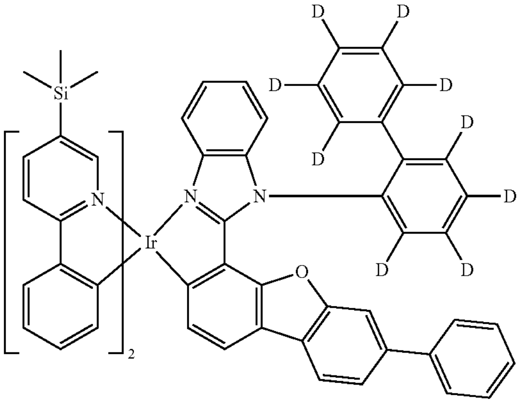
2105
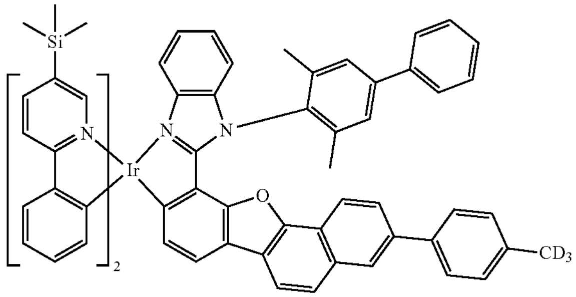
2106
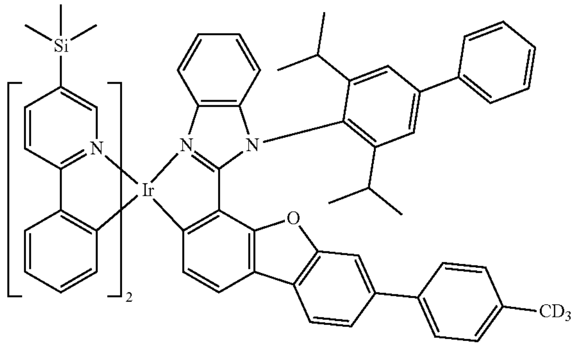
2107
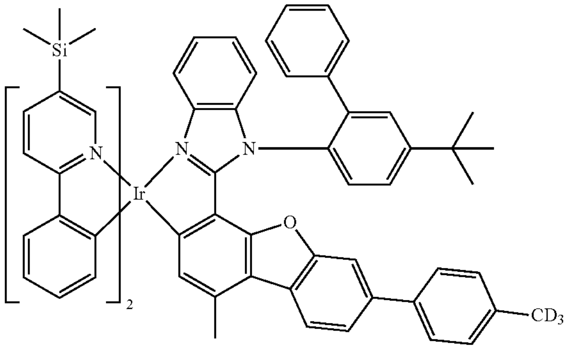
2108
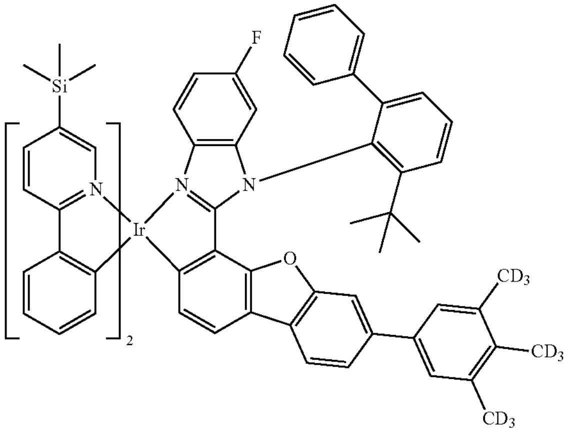
2109
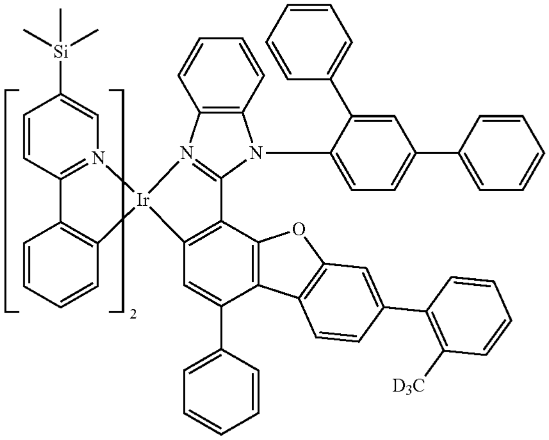

-continued
2110
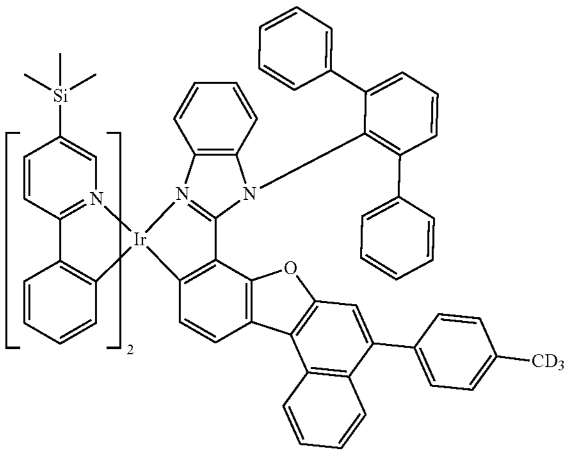
2111
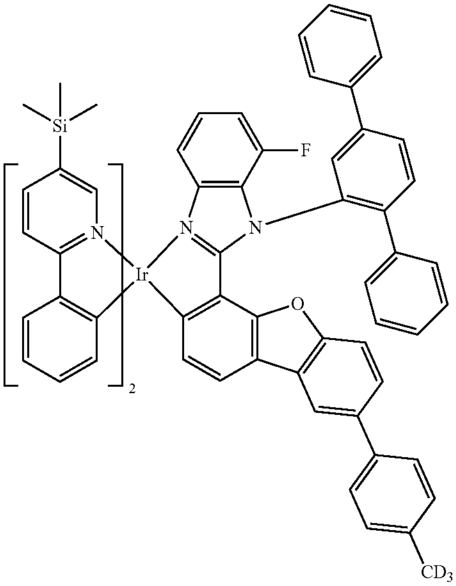
2112
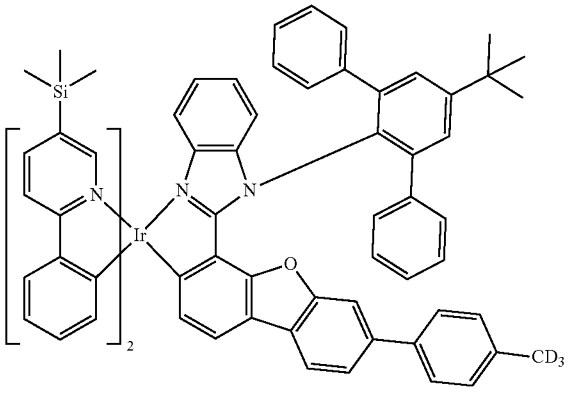
-continued
2113
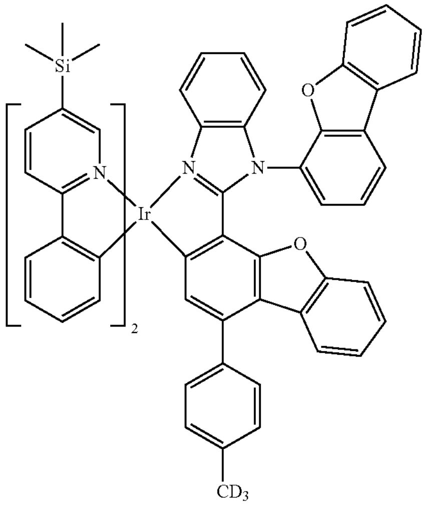
2114
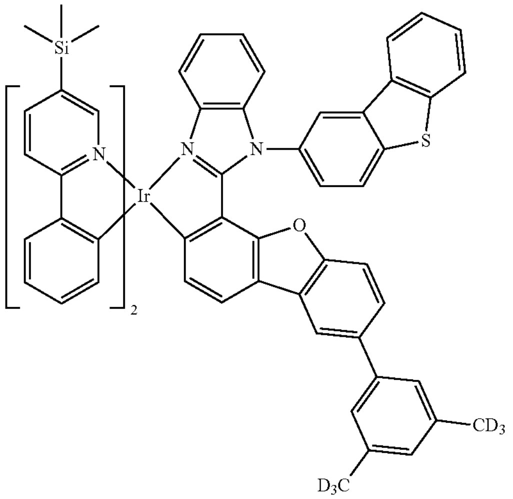
2115
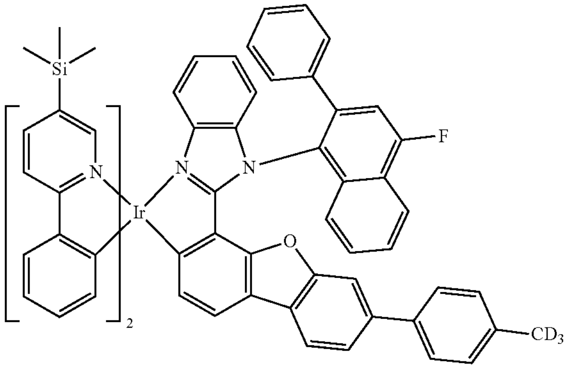

-continued
2116
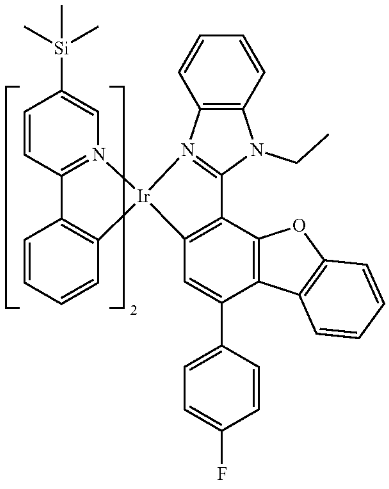
2117
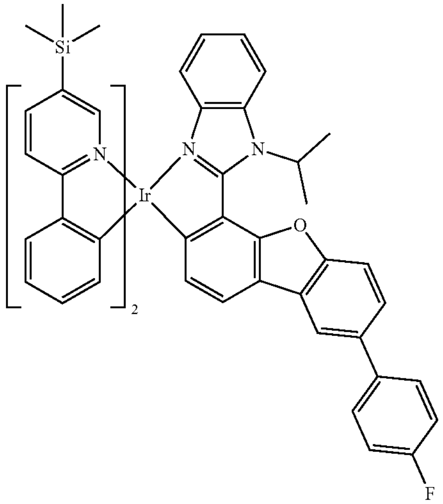
2118
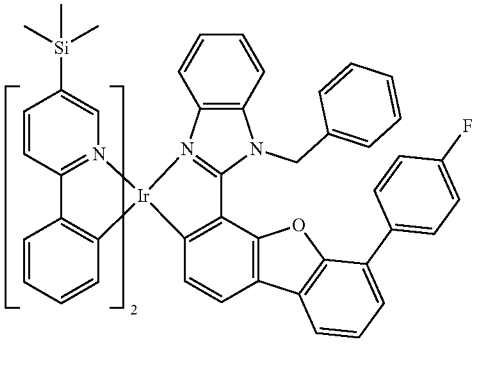
-continued
2119
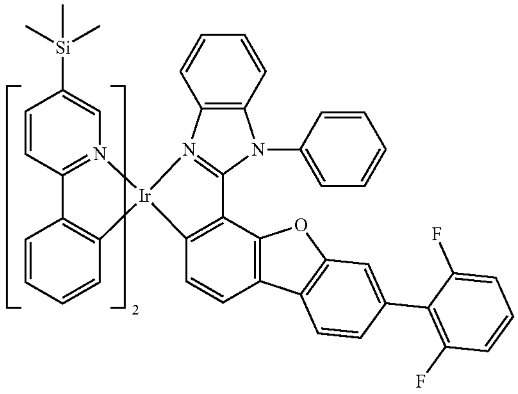
2120
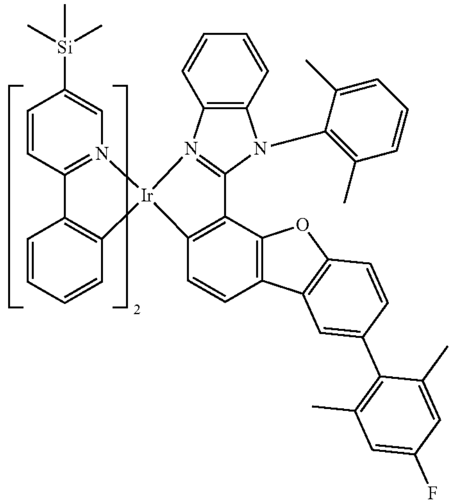
2121
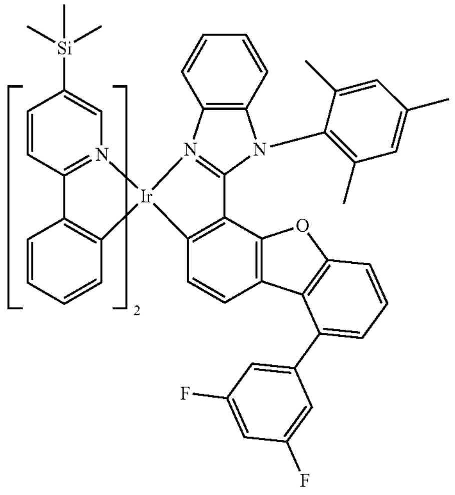

-continued
2122
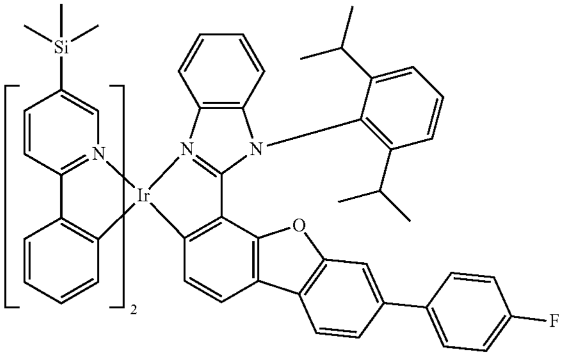
2123
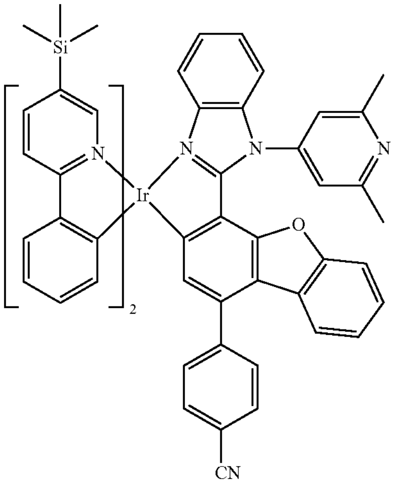
2124
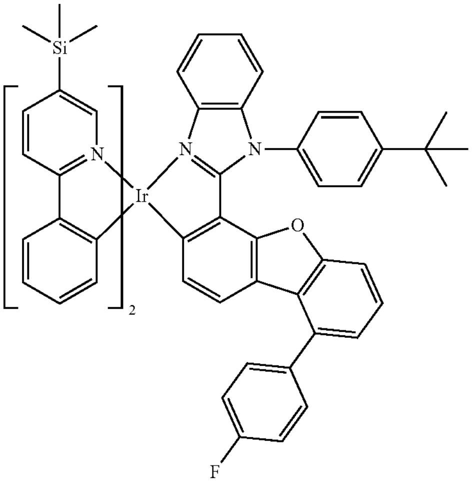
-continued
2125
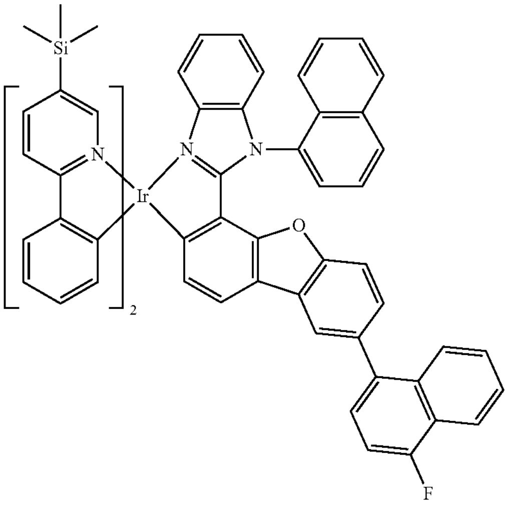
2126
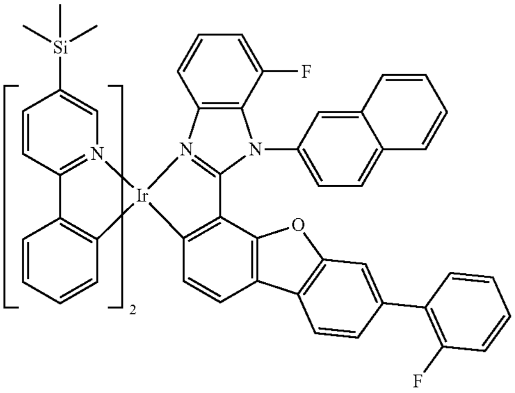
2127
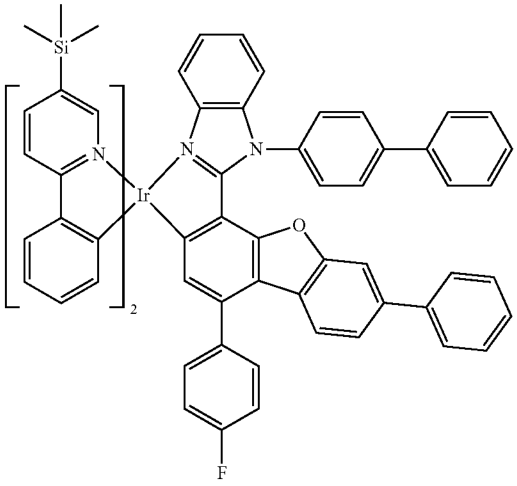

-continued
2128
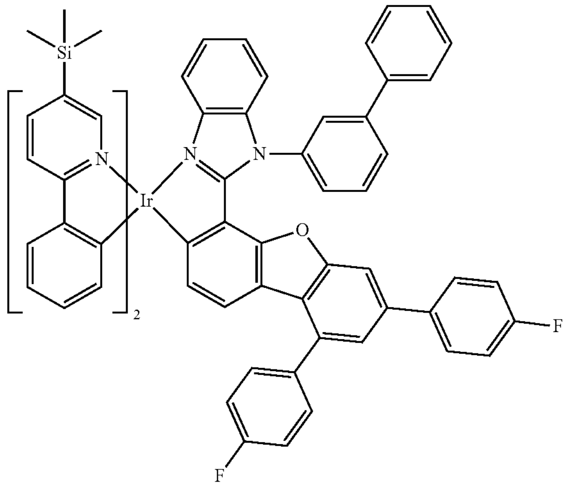
2129
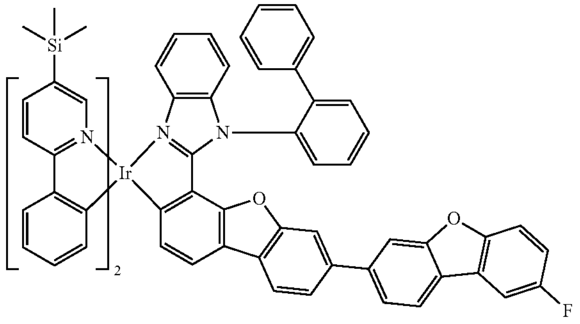
2130
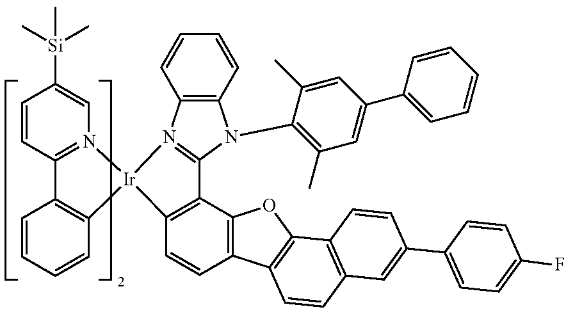
2131
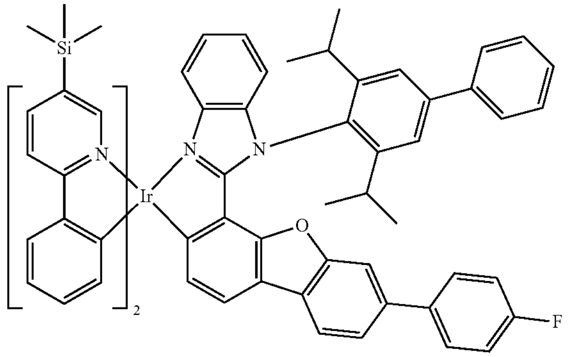
-continued
2132
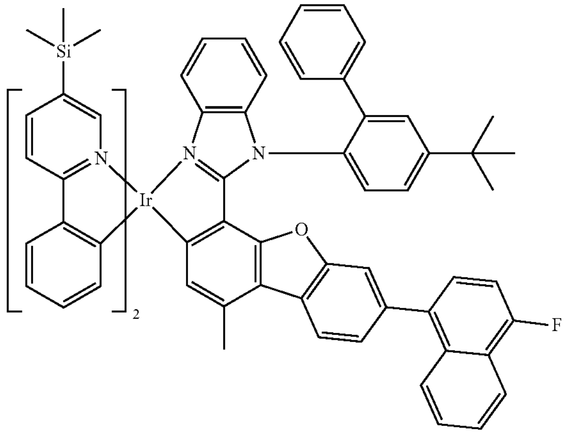
2133
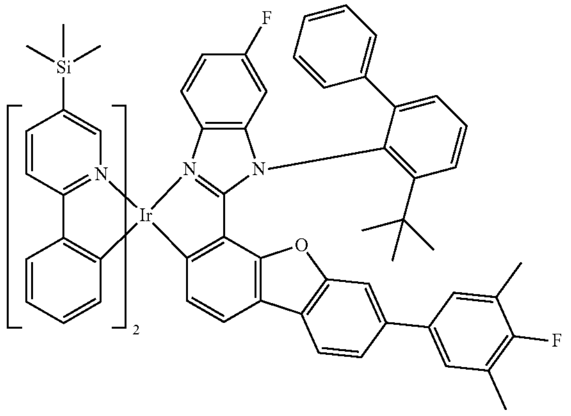
2134
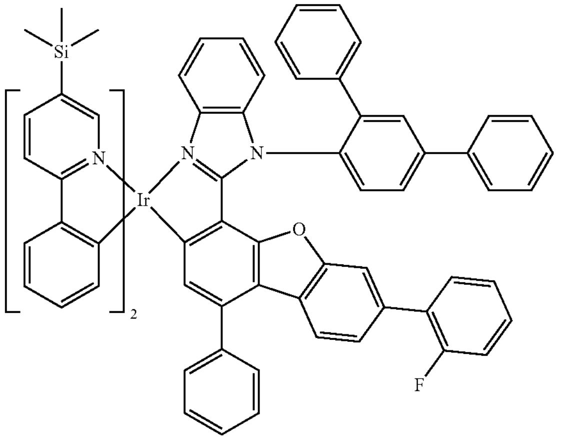

-continued
2135
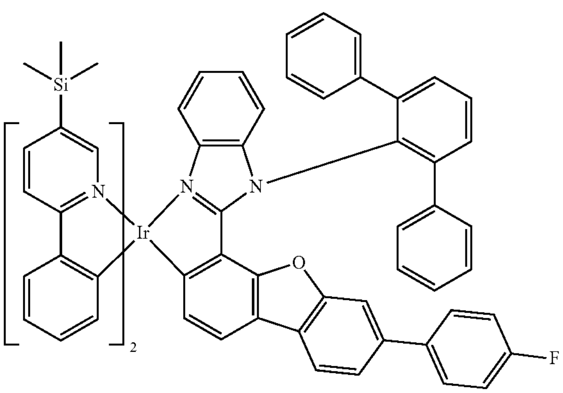
2136
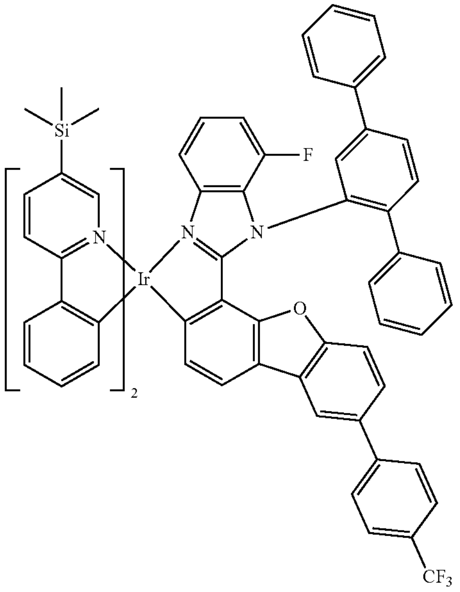
2137
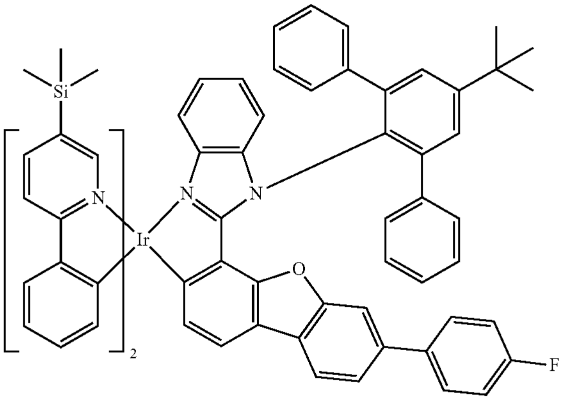
-continued
2138
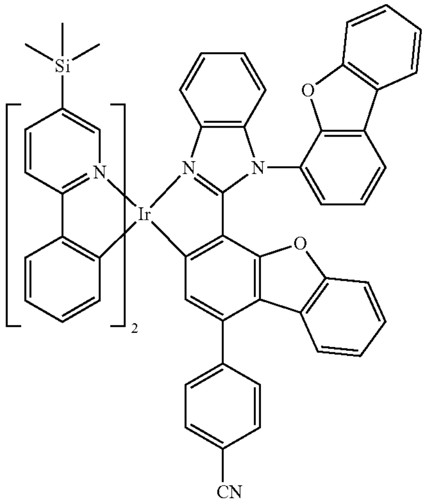
2139
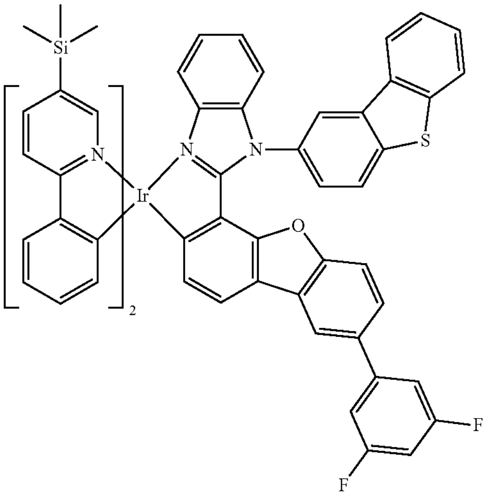
2140
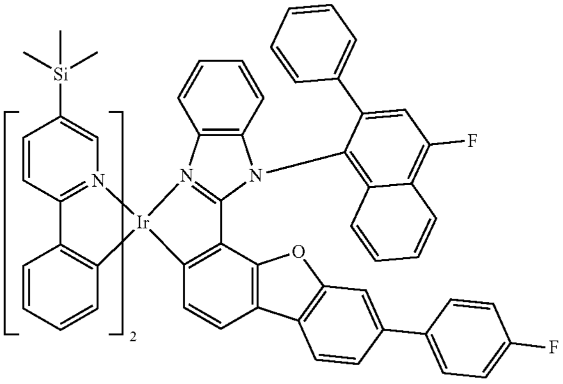

-continued
2141
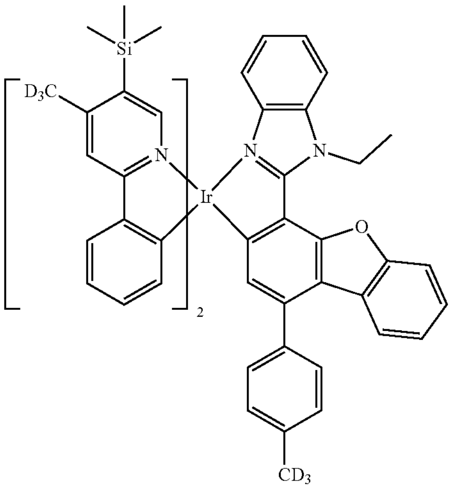
2142
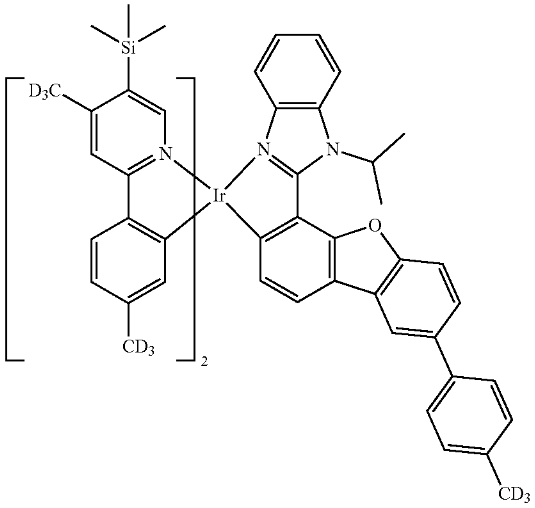
2143
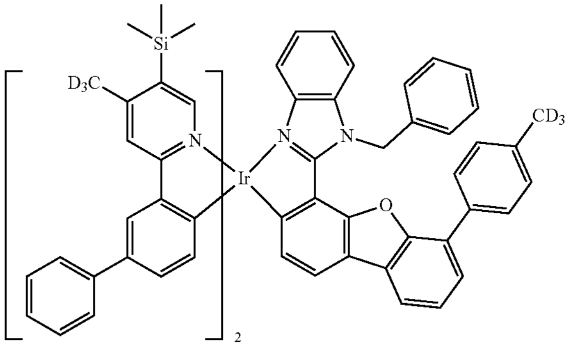
-continued
2144
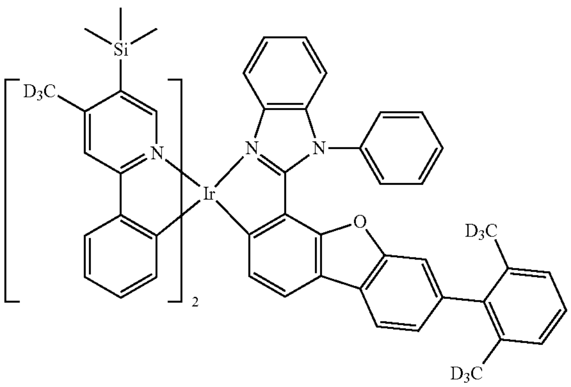
2145
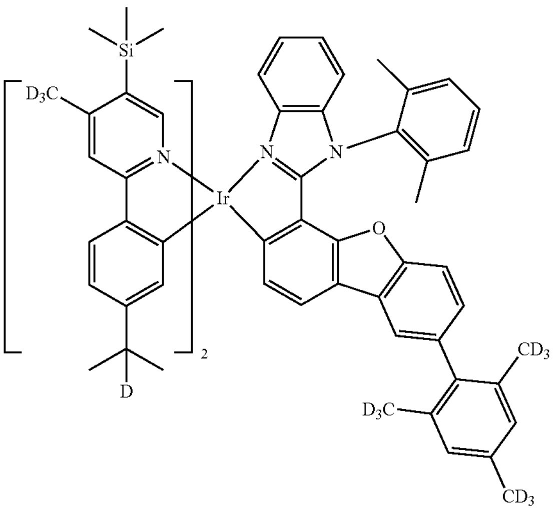
2146
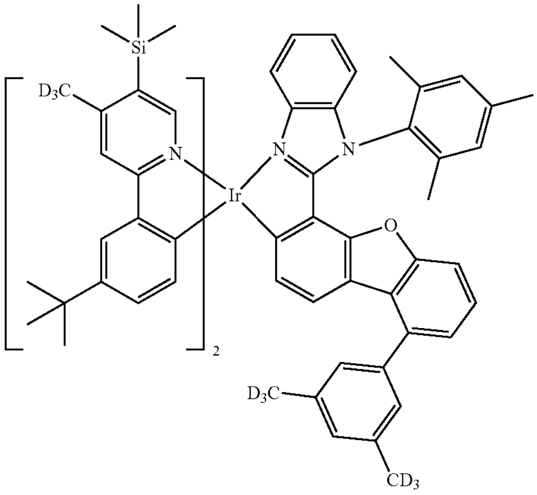

2147
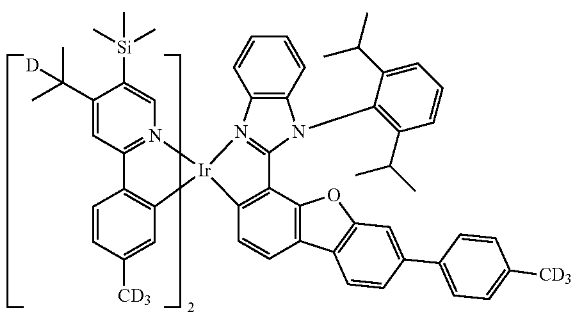
2148
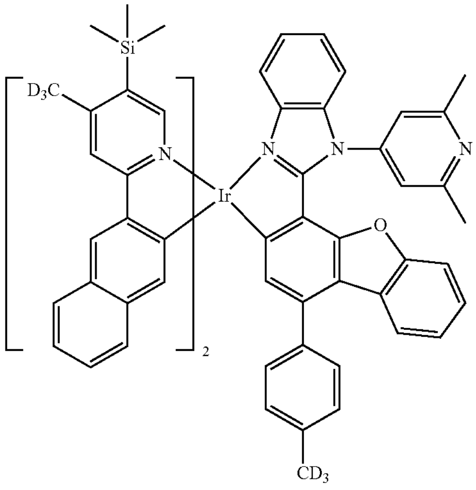
2149
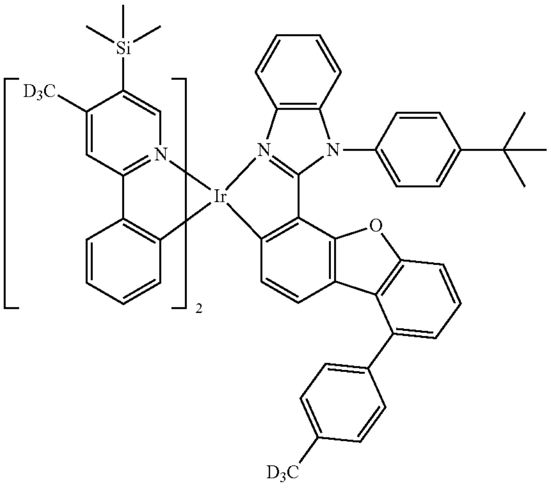
2150
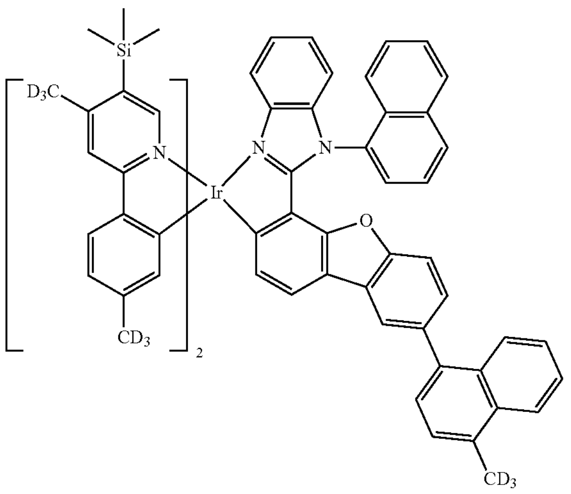
2151
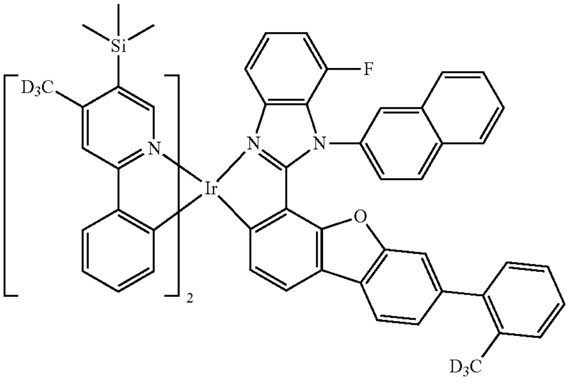
2152
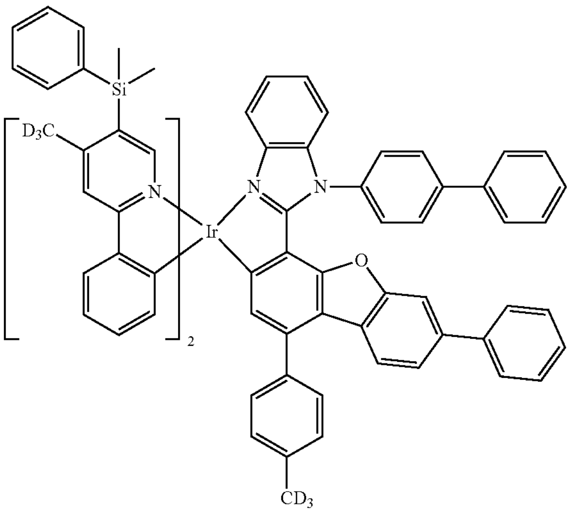

-continued
2153
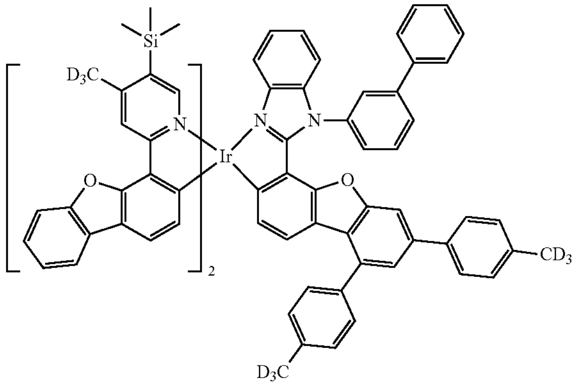
2154
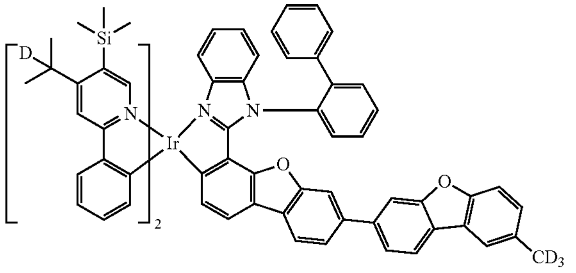
2155
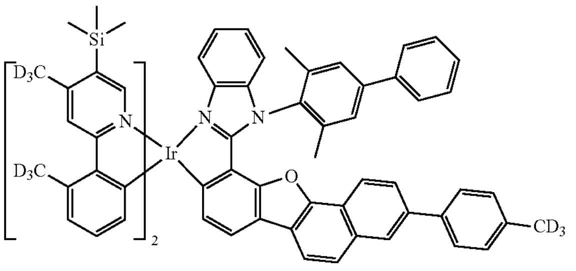
2156
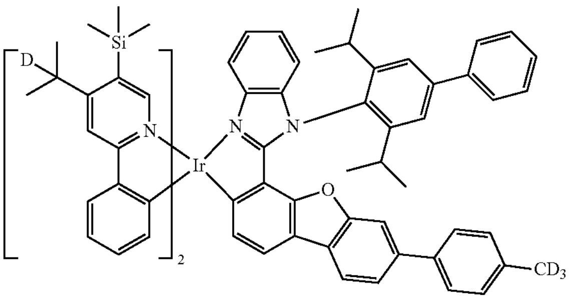
-continued
2157
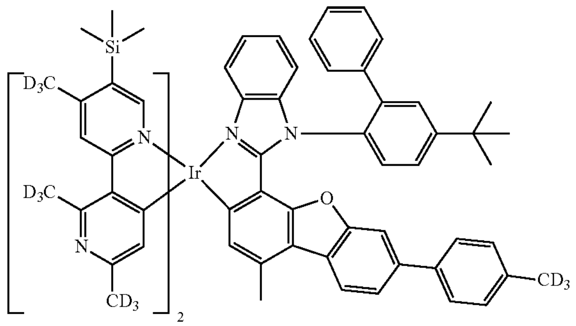
2158
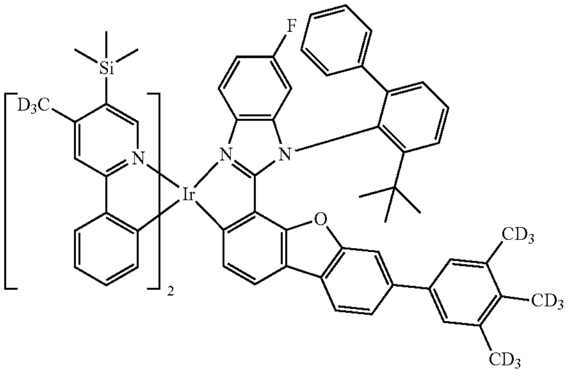
2159
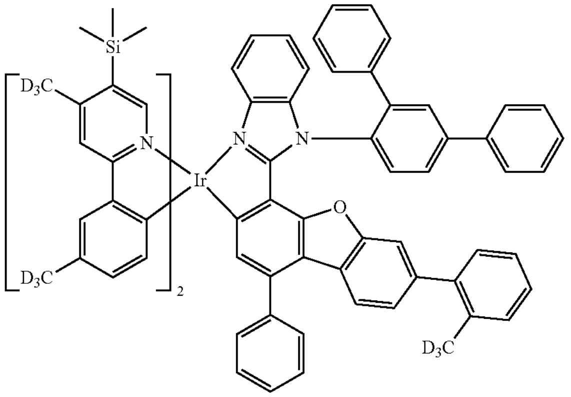
2160
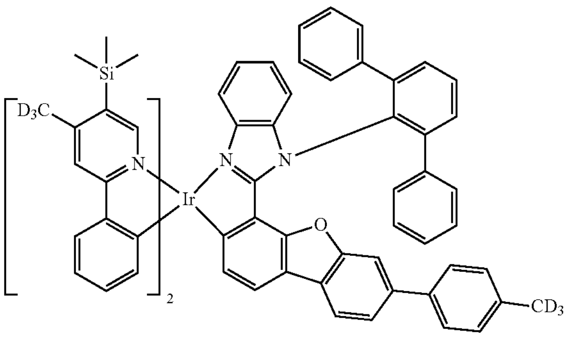

-continued
2161
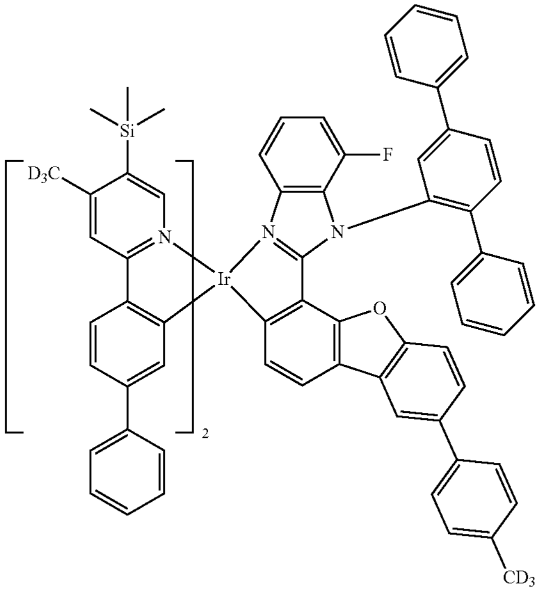
2162
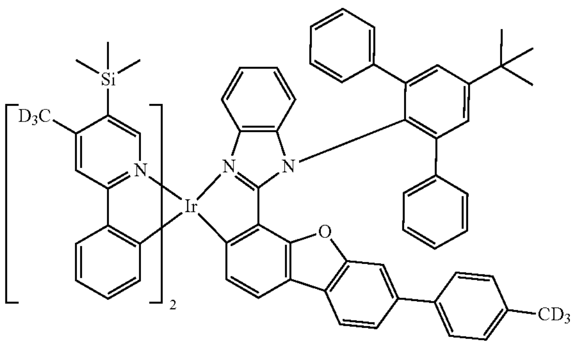
2163
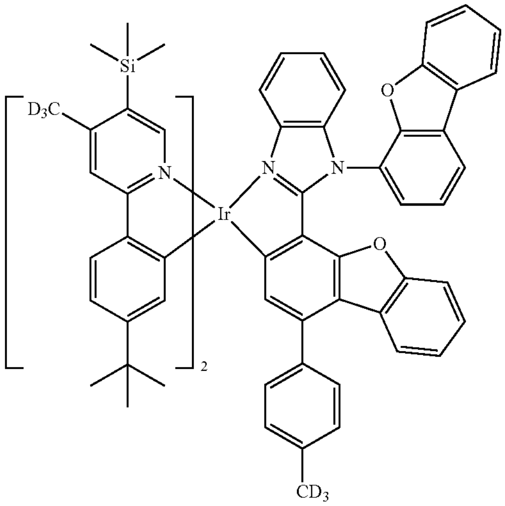
-continued
2164
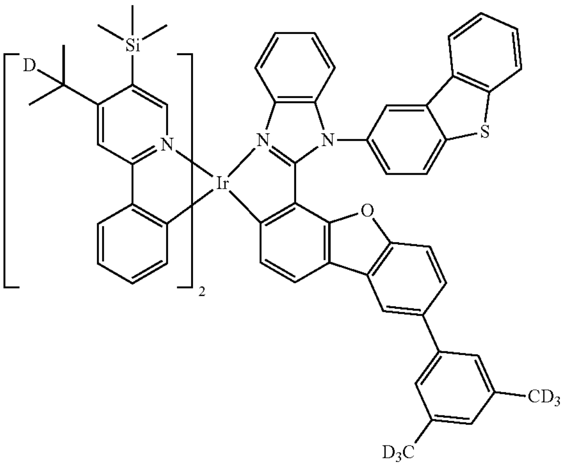
2165
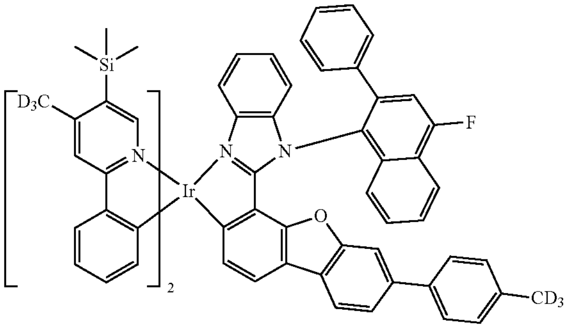
2166
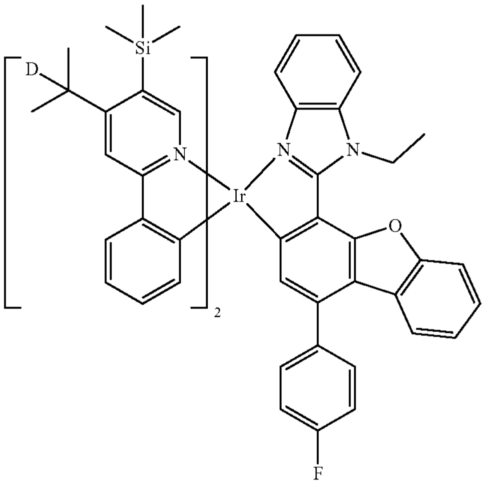

-continued
2167
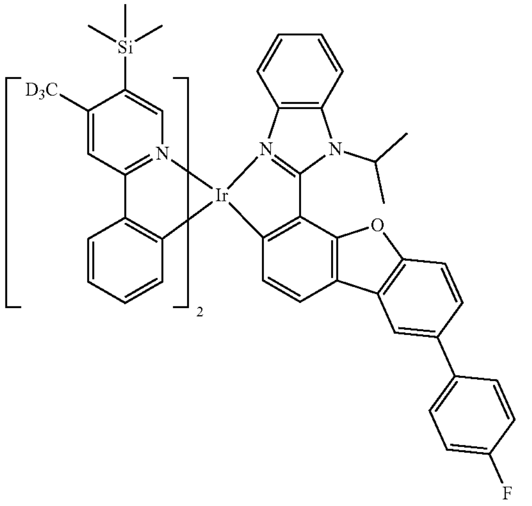
2168
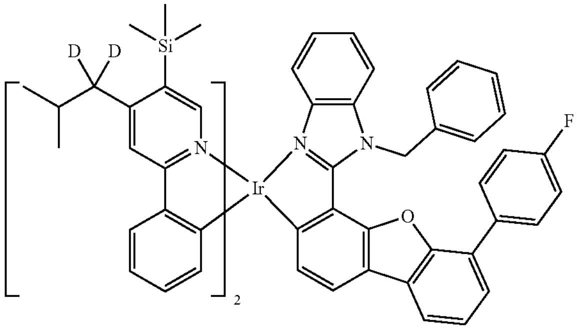
2169
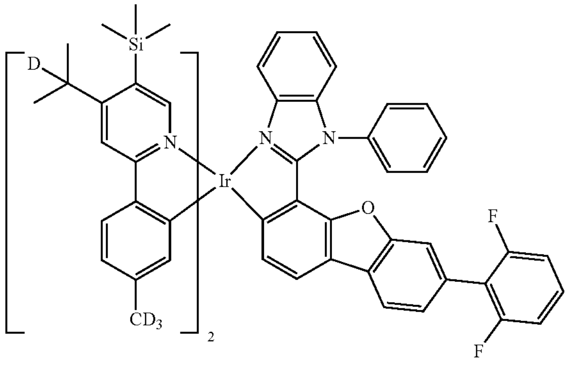
2170
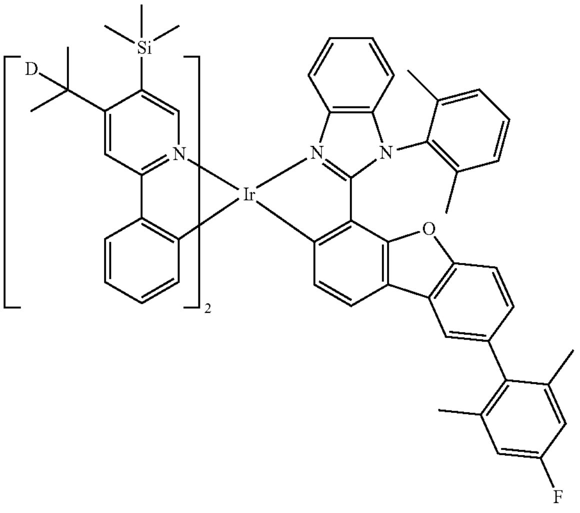
2171
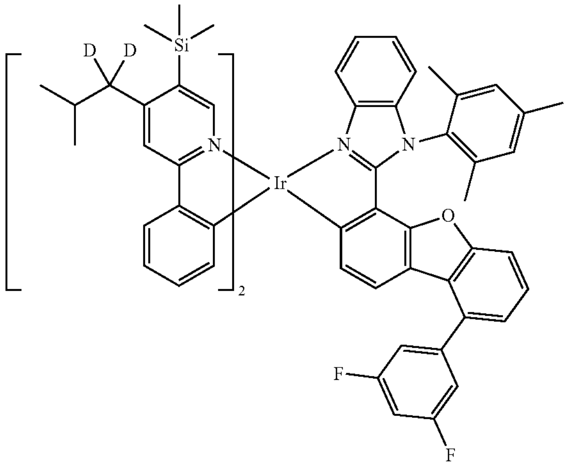
2172
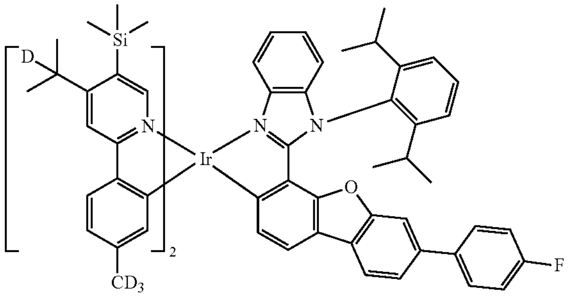

-continued
2173
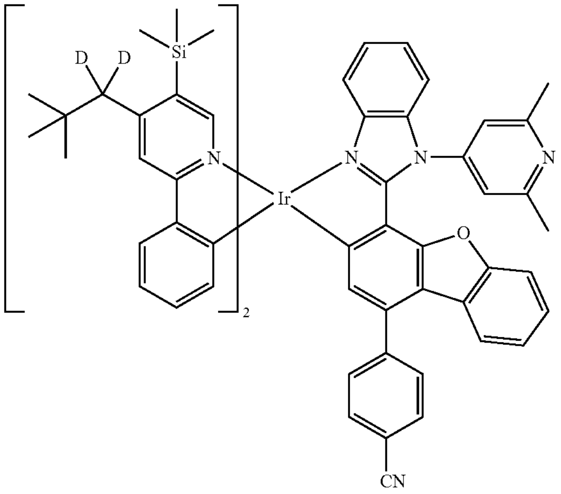
2174
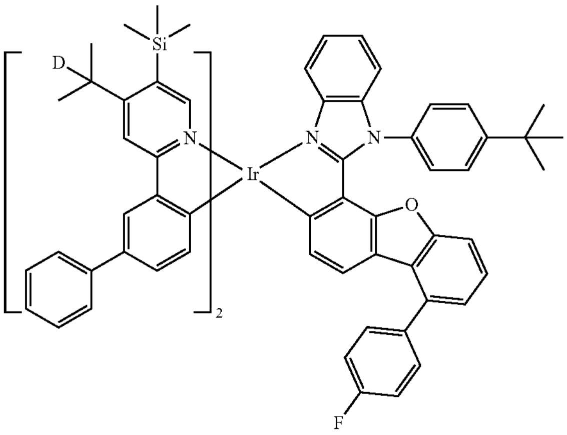
2175
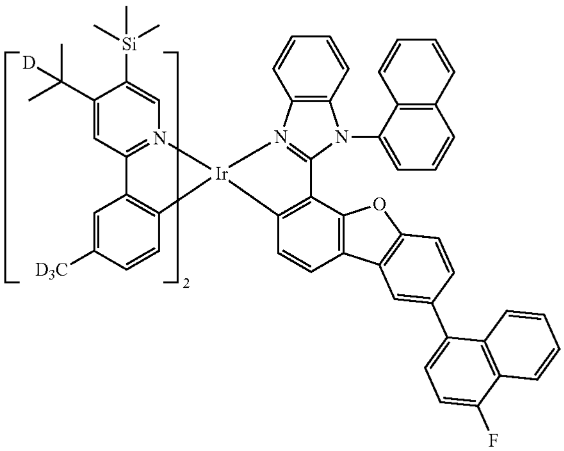
-continued
2176
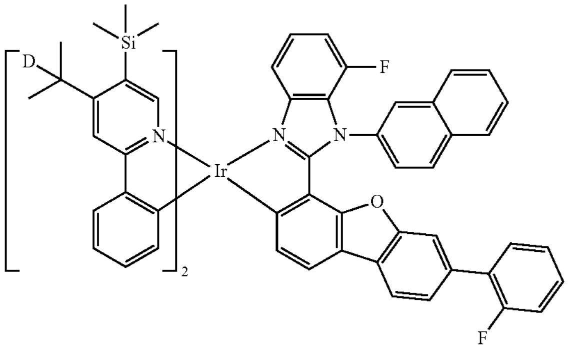
2177
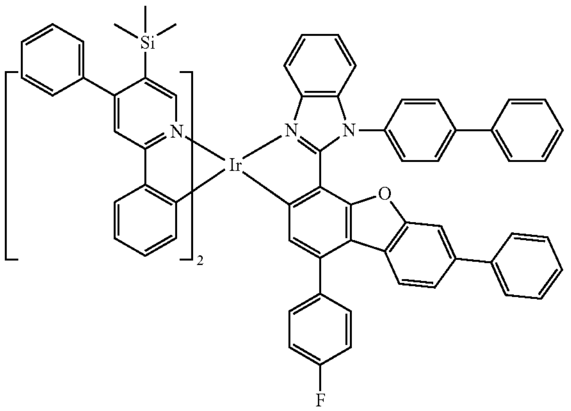
2178
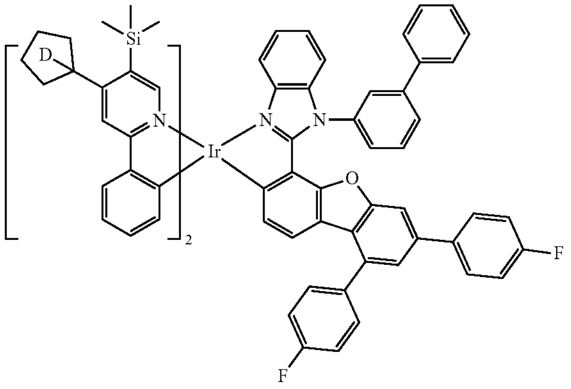
2179
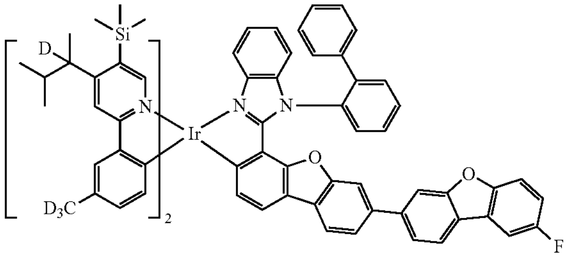

-continued
2180
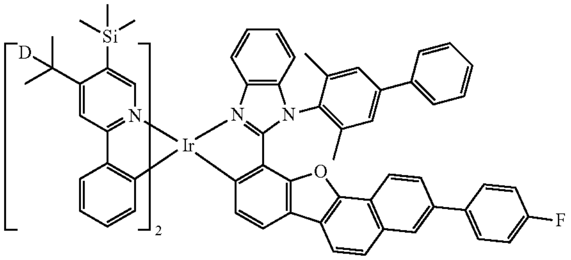
2181
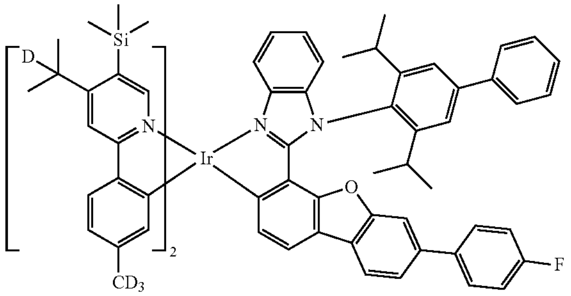
2182
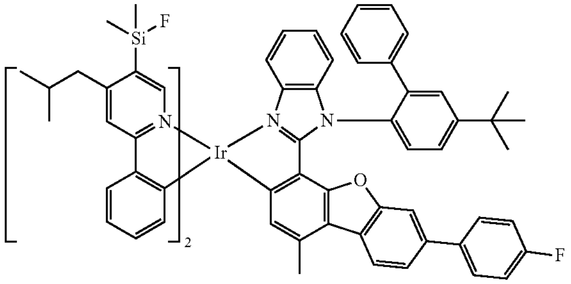
2183
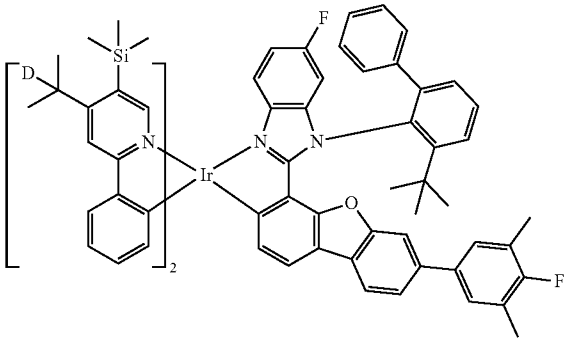
2184
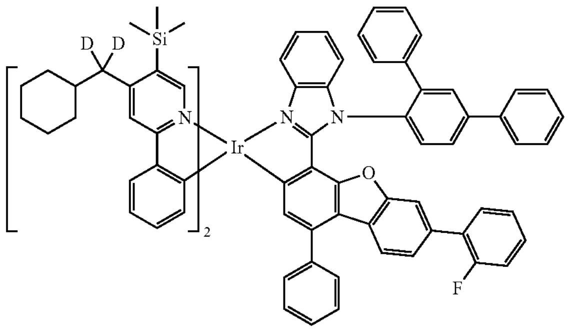
-continued
2185
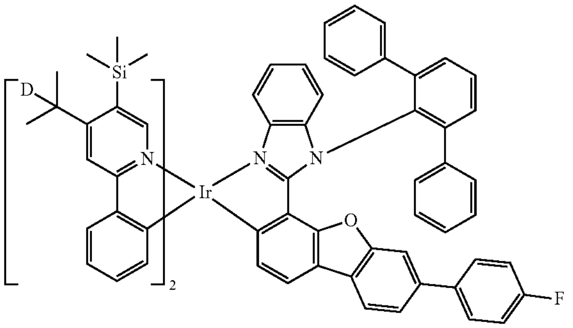
2186
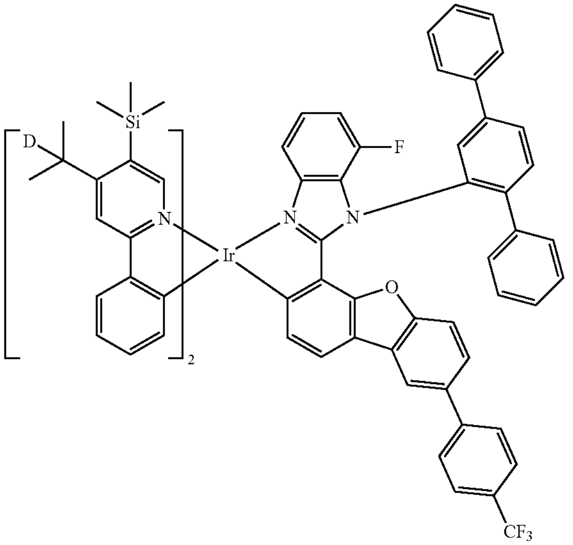
2187
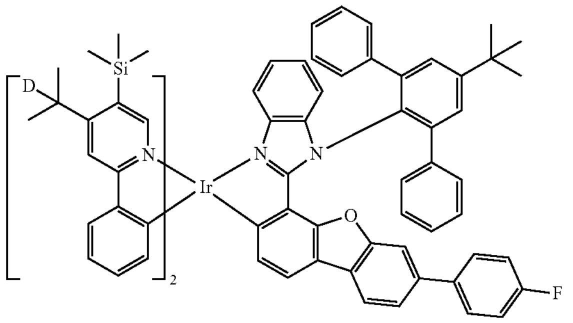

-continued
2188
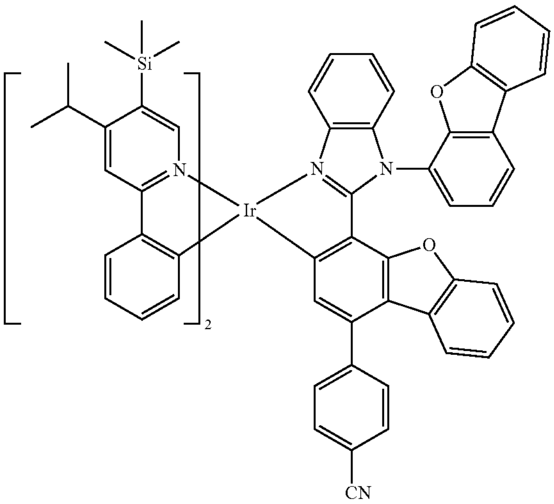
2189
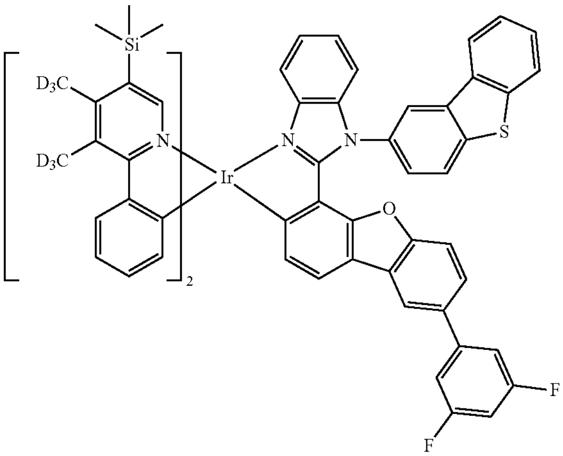
2190
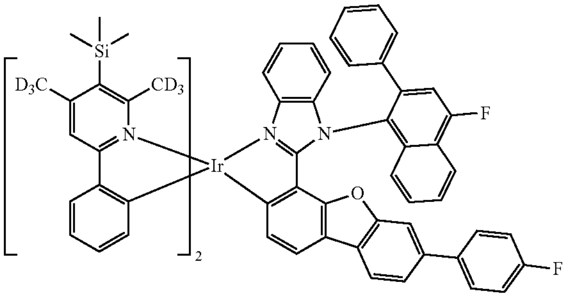
-continued
2191
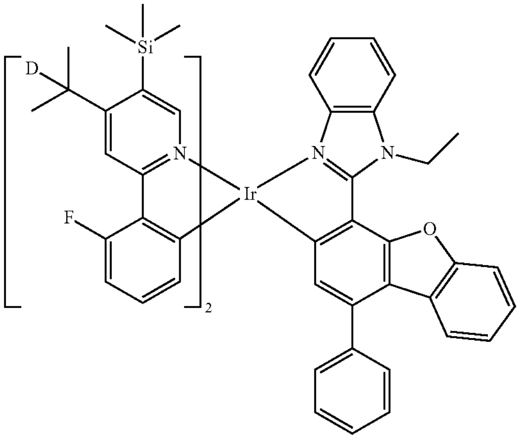
2192
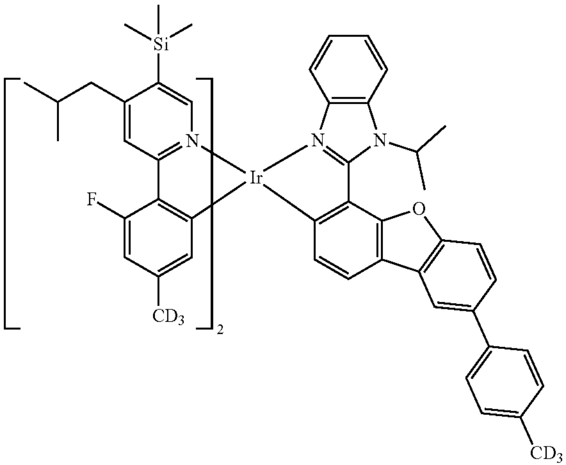
2193
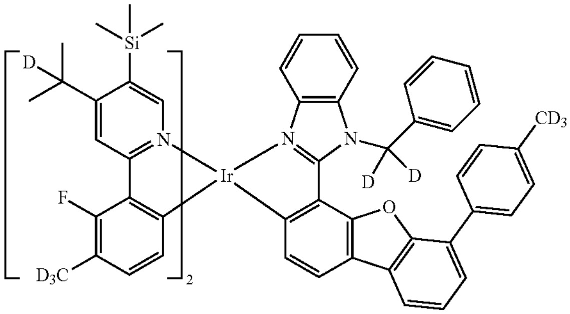
2194
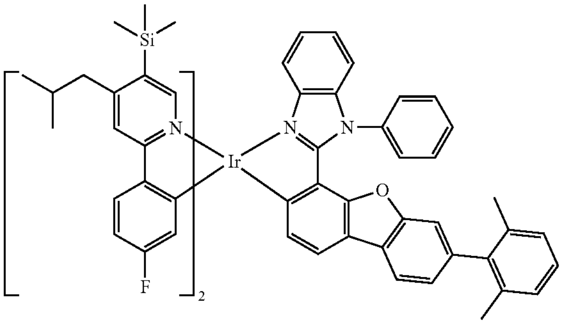

-continued
2195
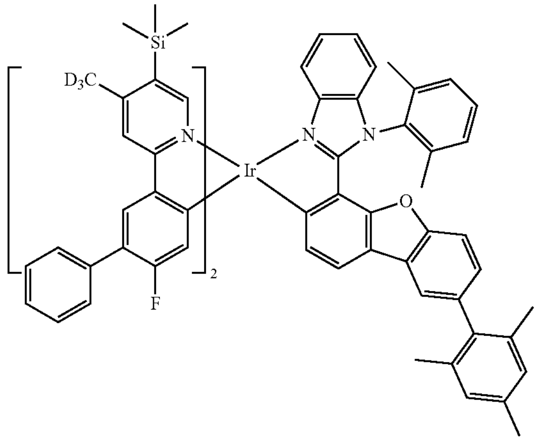
2196
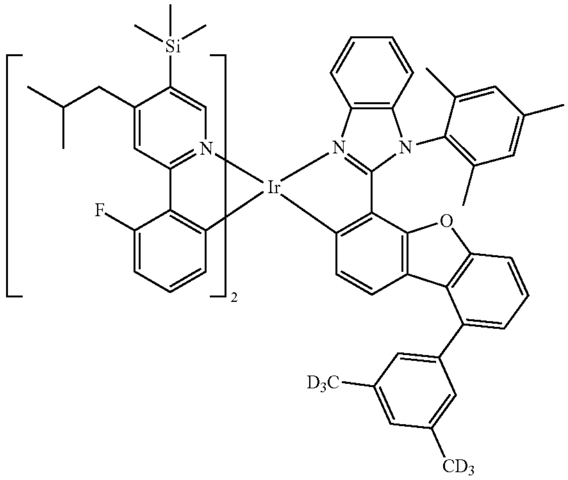
2197
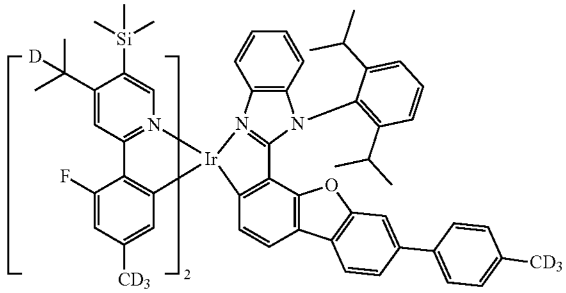
-continued
2198
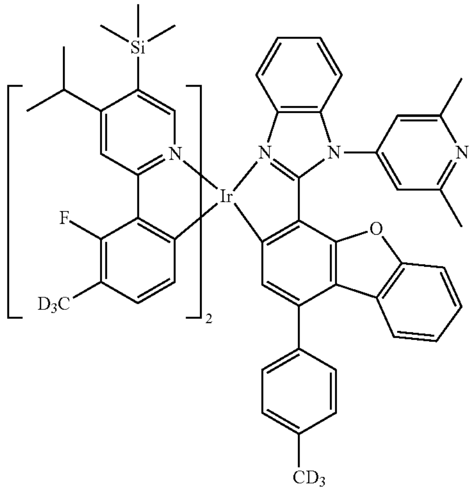
2199
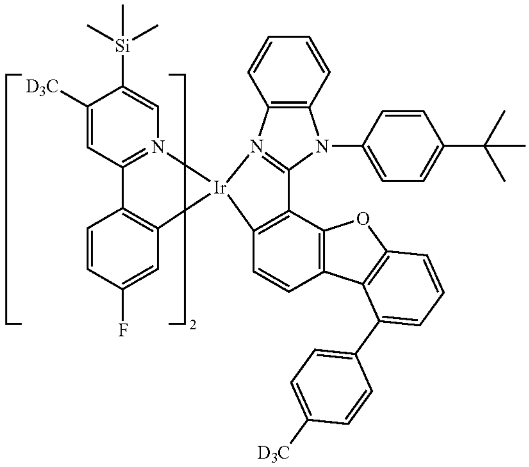
2200
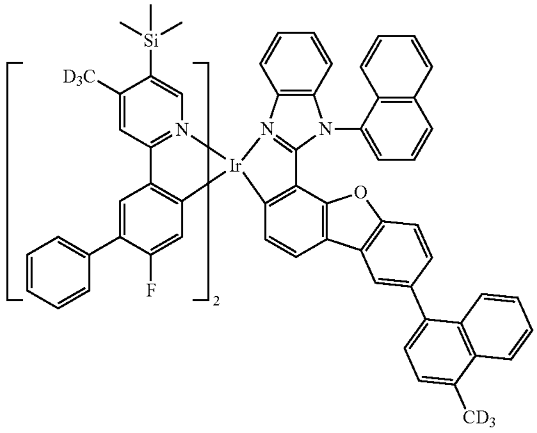

-continued
2201
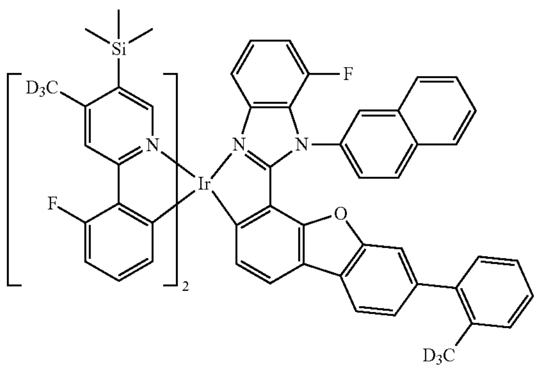
2202
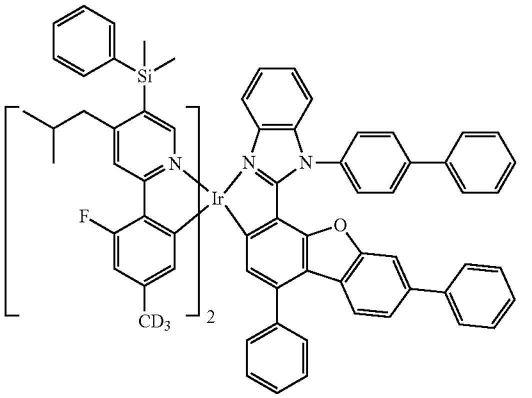
2203
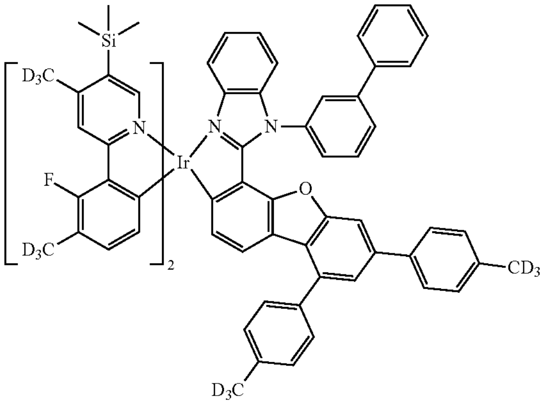
2204
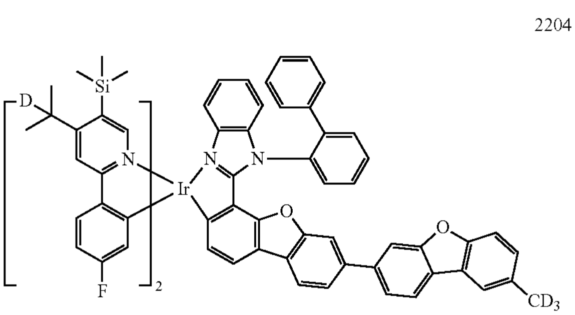
-continued
2205
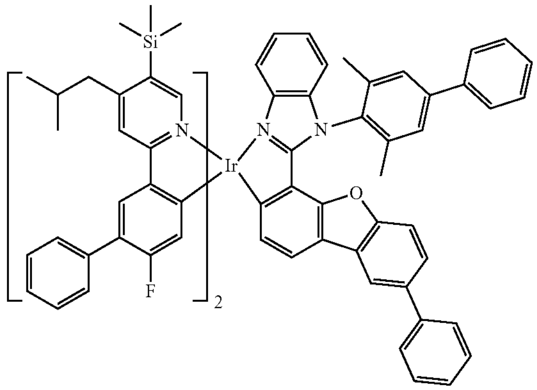
2206
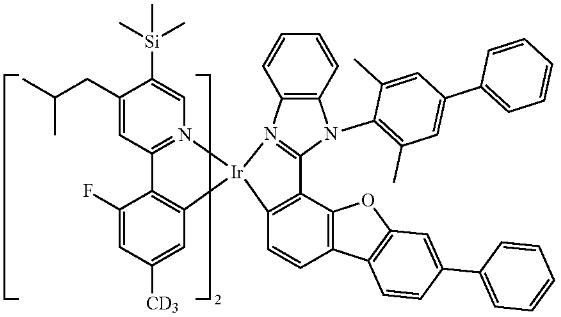
2207
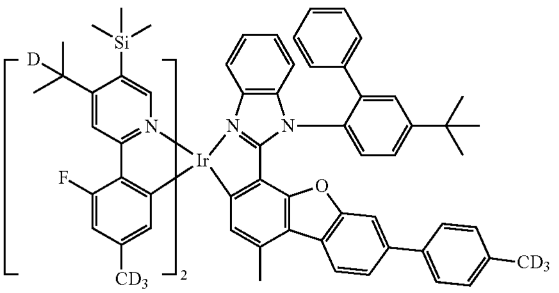
2208
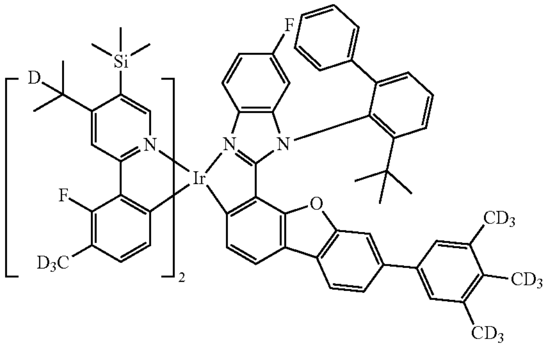

-continued
2209
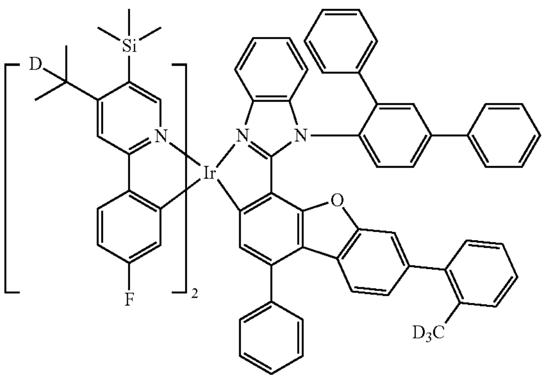
2210
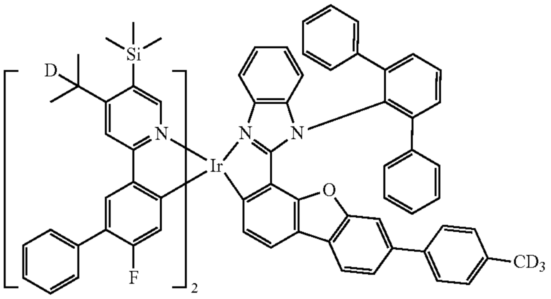
2211
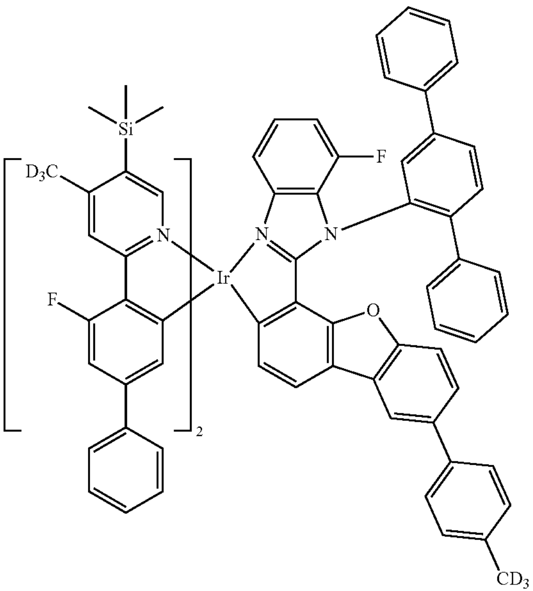
-continued
2212
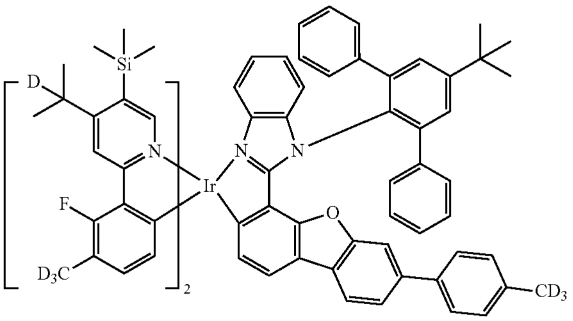
2213
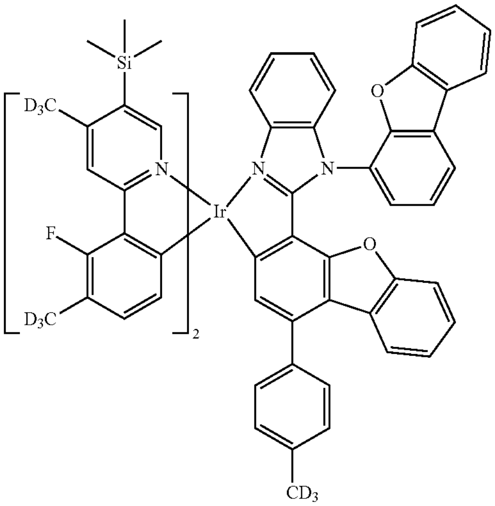
2214
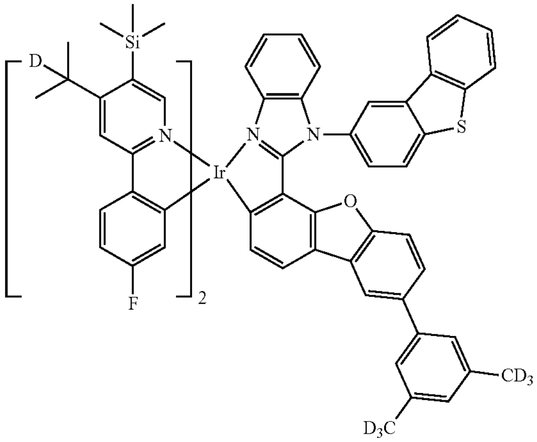
2215
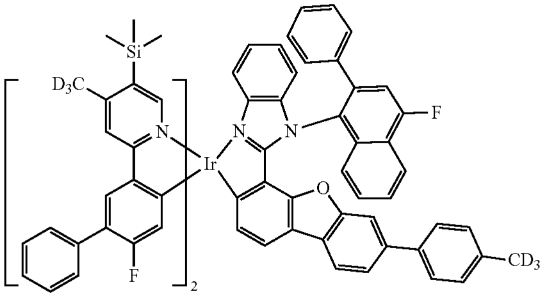

-continued
2216
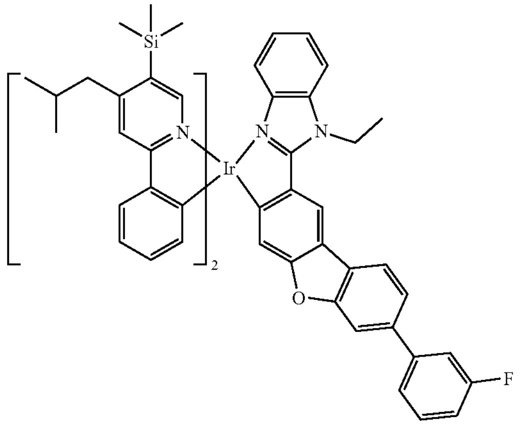
2217
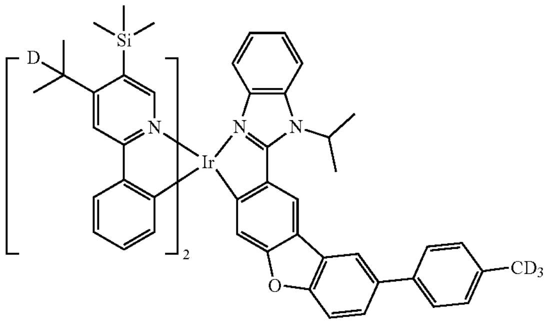
2218
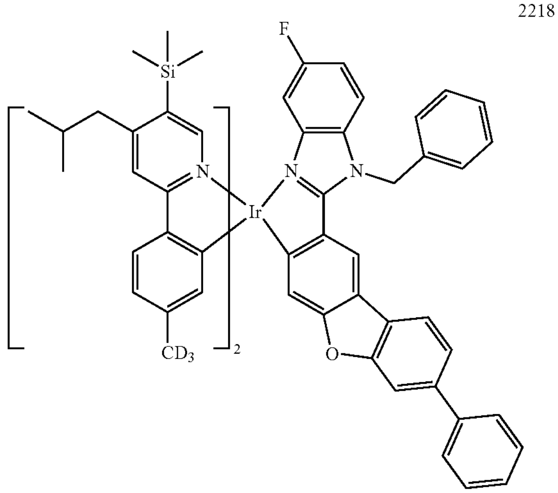
2219
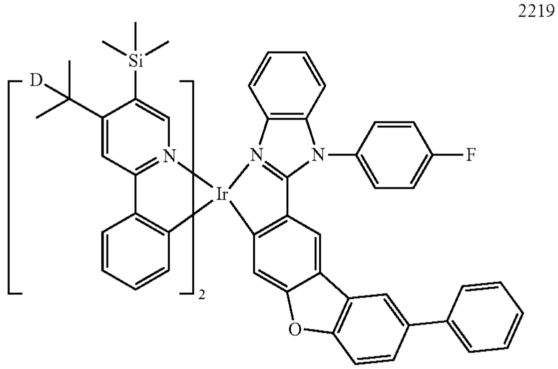
-continued
2220
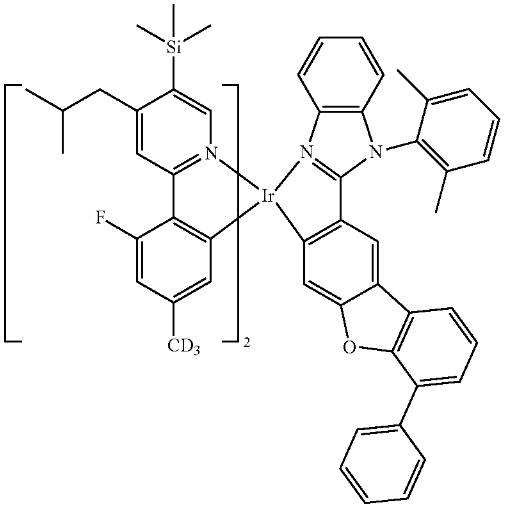
2221
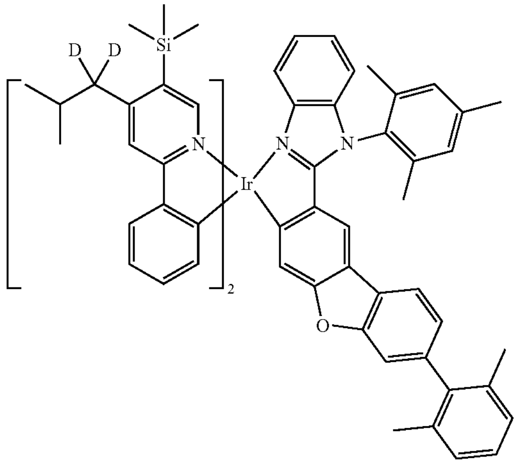
2222
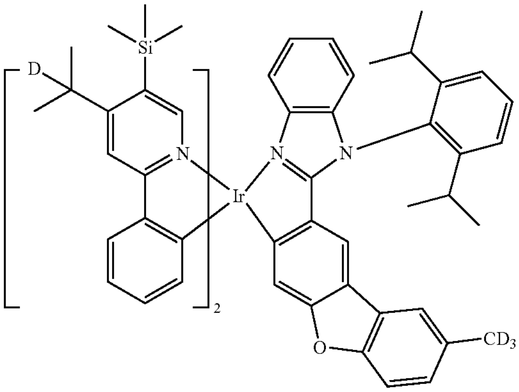

2223
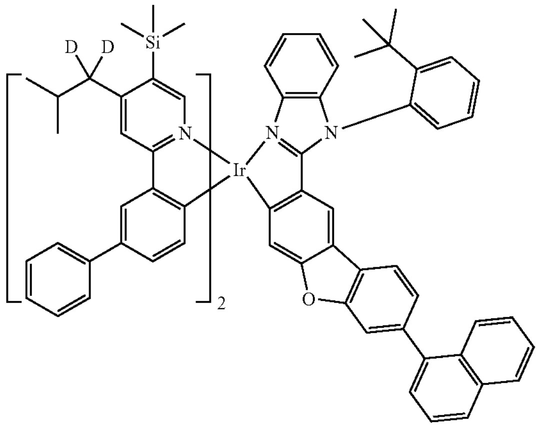
2224
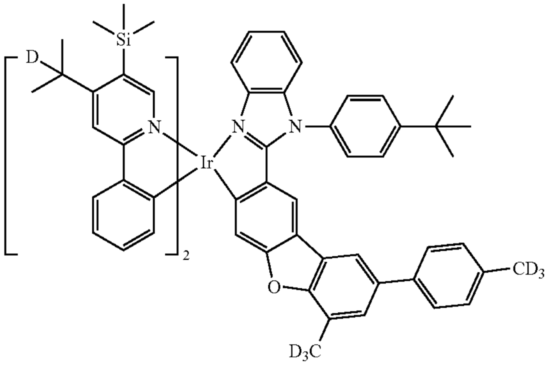
2225
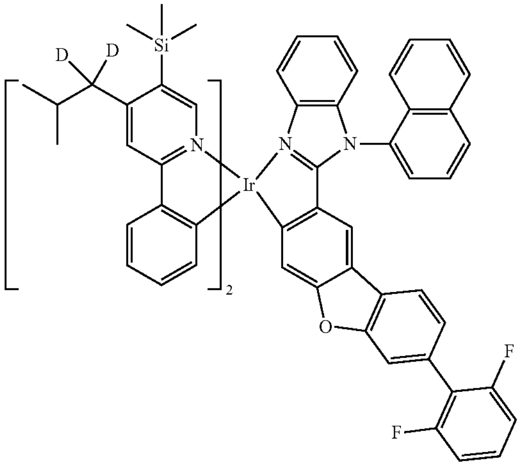
2226
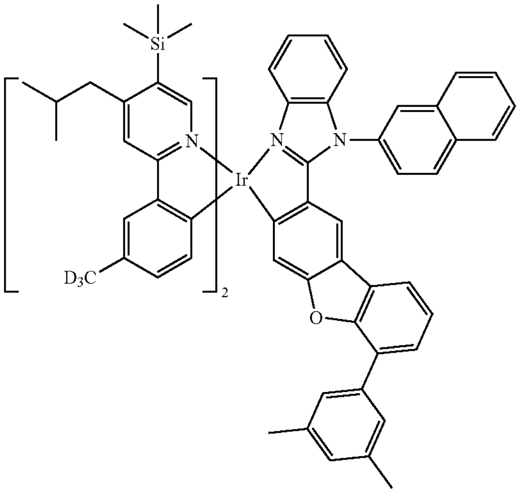
2227
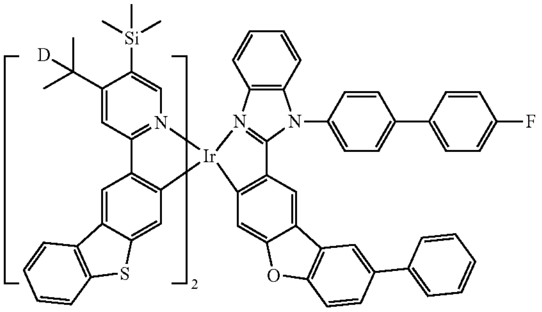
2228
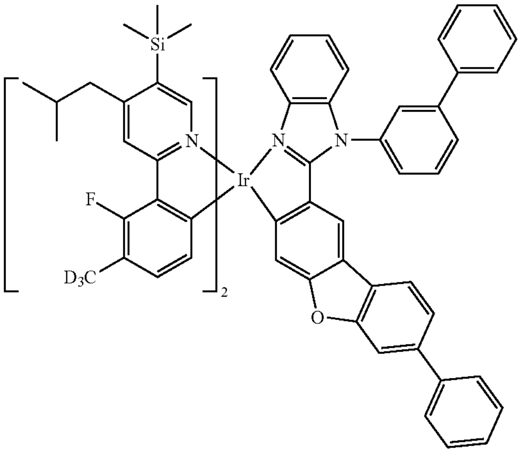

-continued
2229
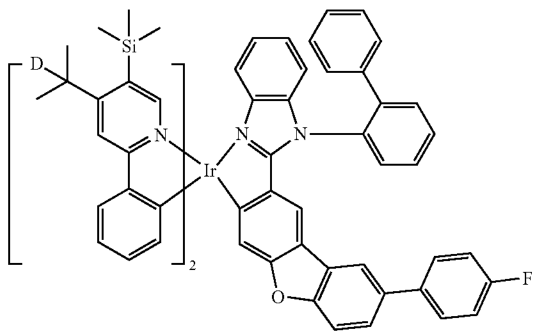
2230
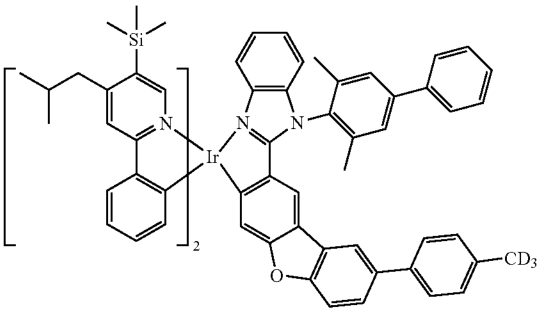
2231
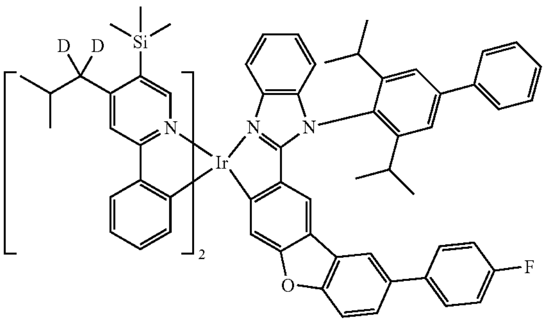
2232
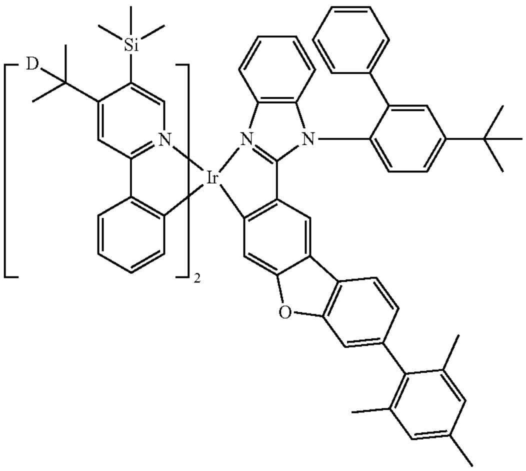
-continued
2233
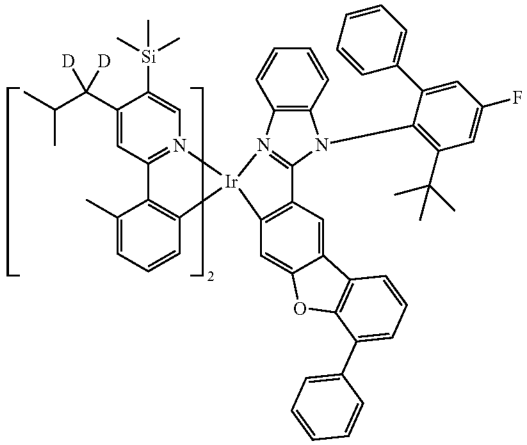
2234
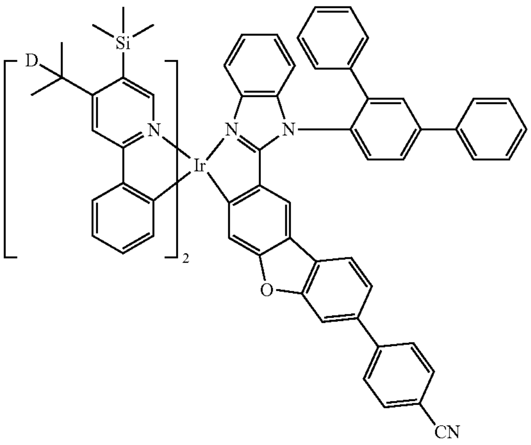
2235
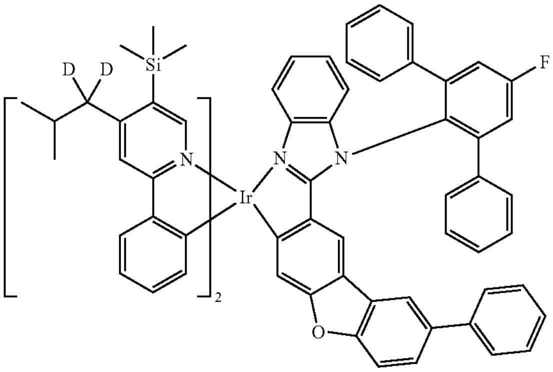

-continued
2236
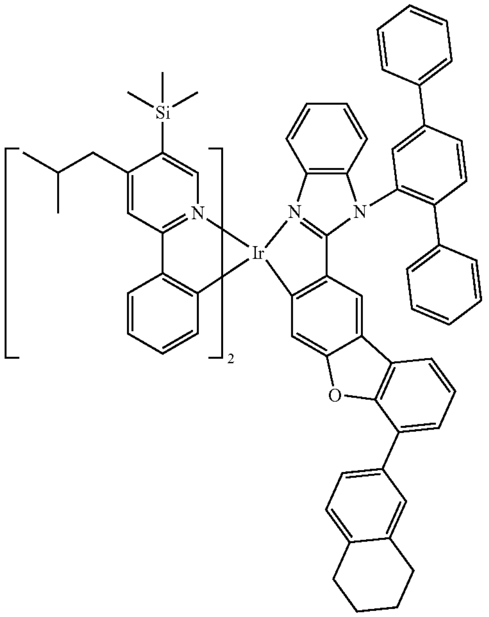
2237
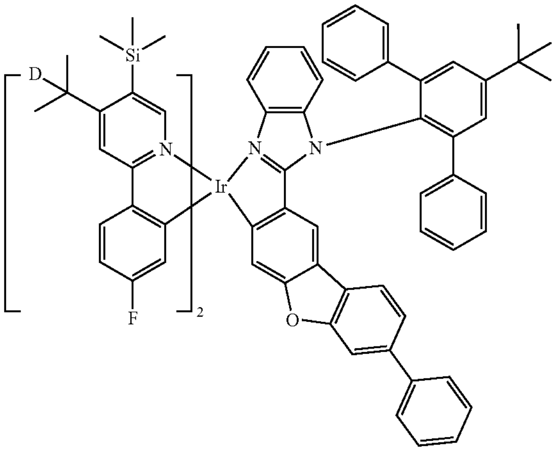
2238
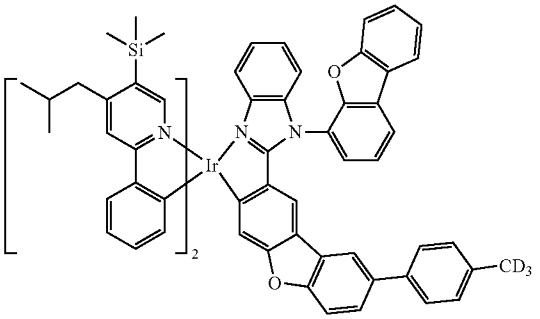
-continued
2239
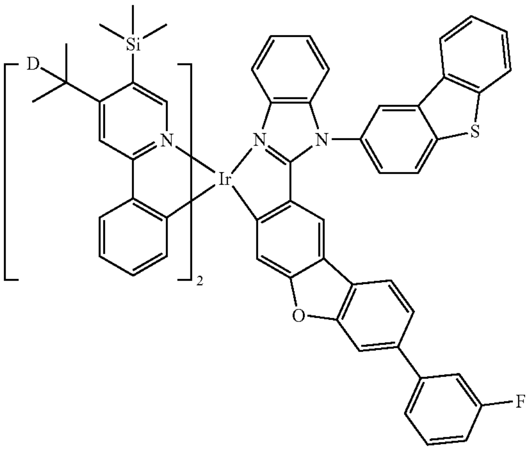
2240
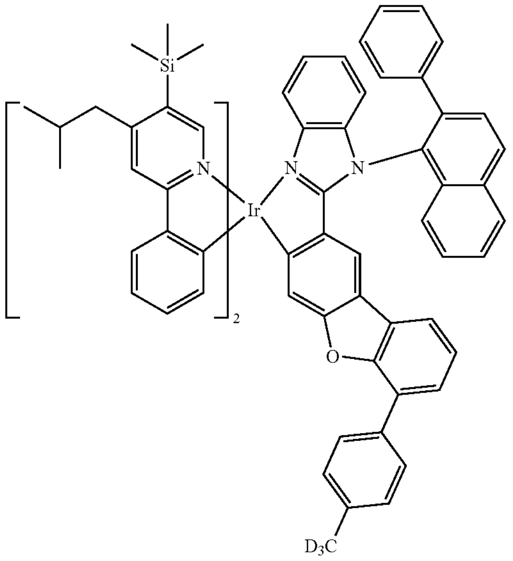
2241
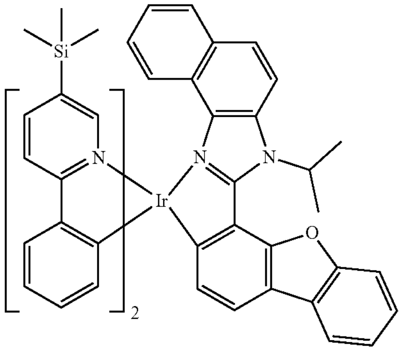

-continued
2242
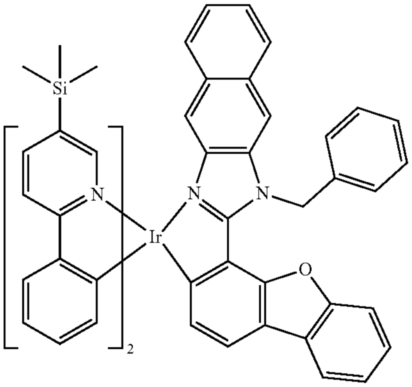
2243
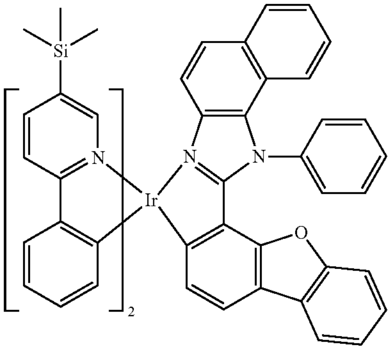
2244
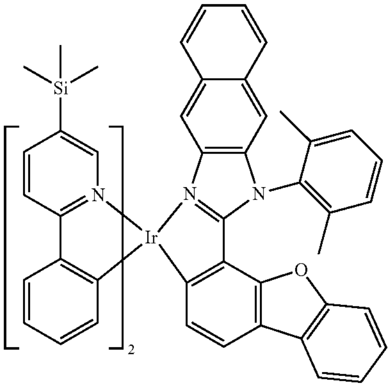
2245
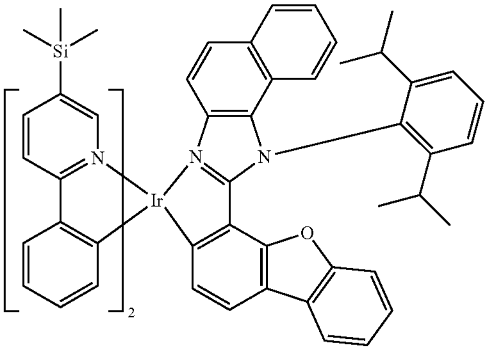
-continued
2246
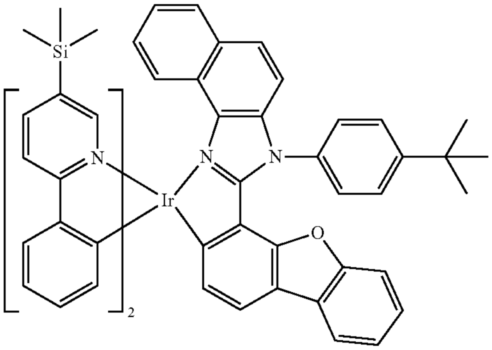
2247
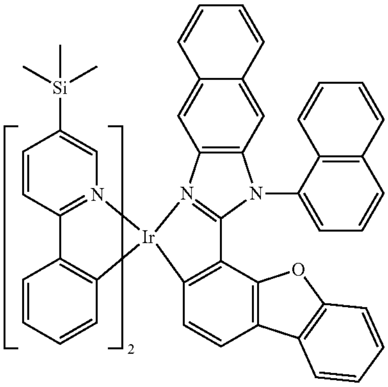
2248
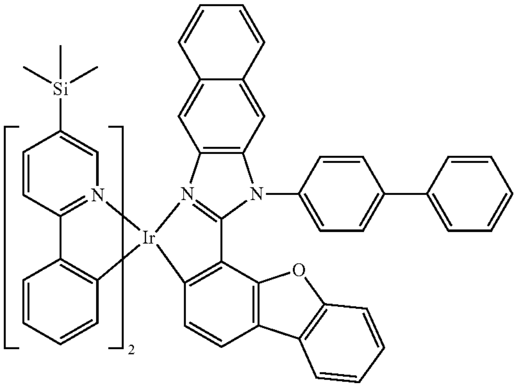
2249
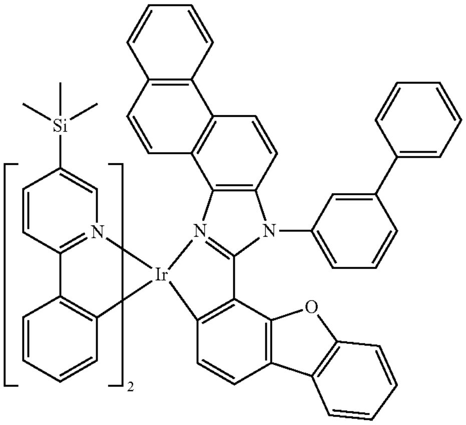

-continued
2250
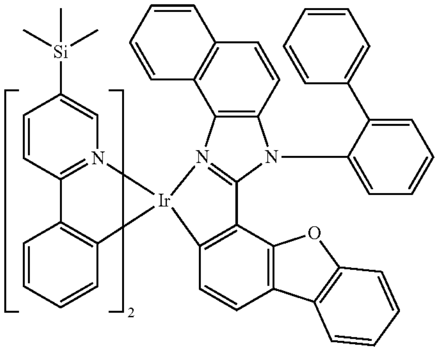
2251
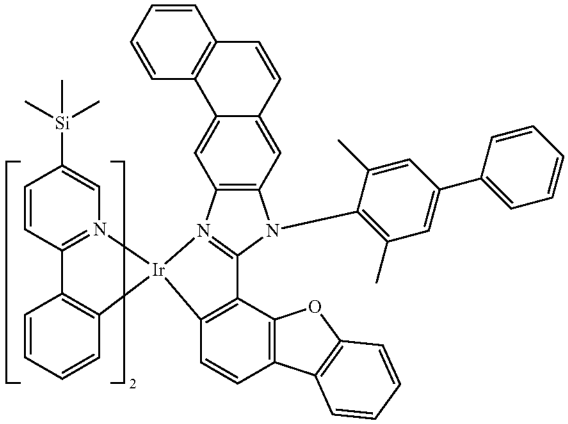
2252
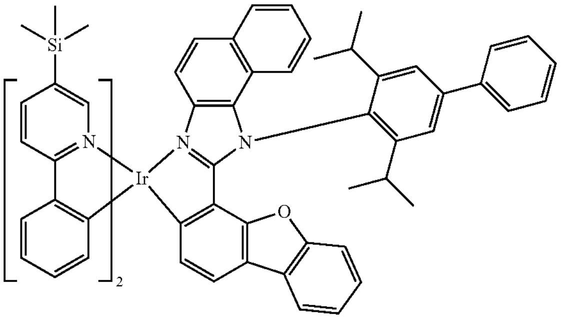
2253
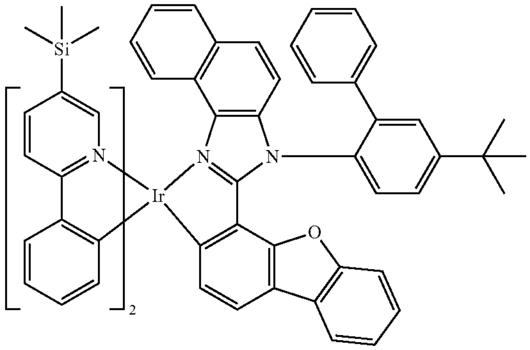
-continued
2254
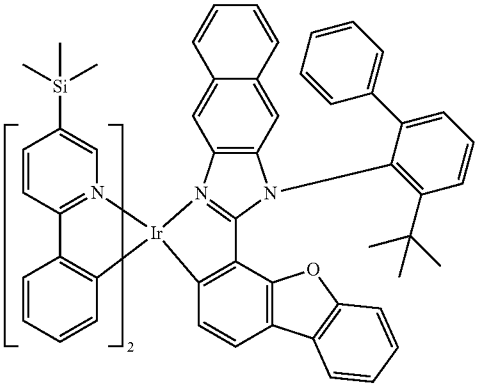
2255
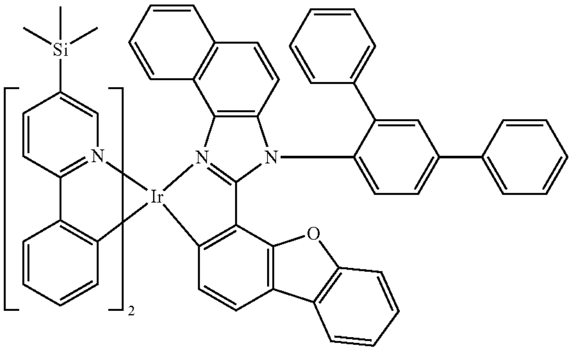
2256
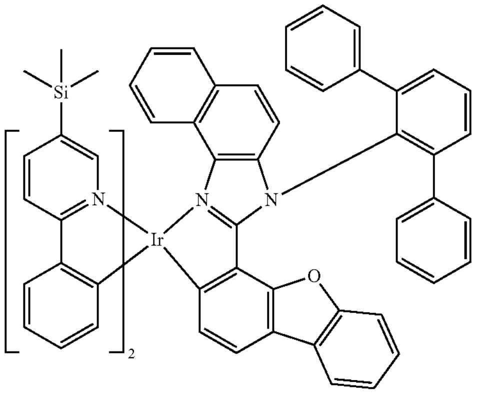
2257
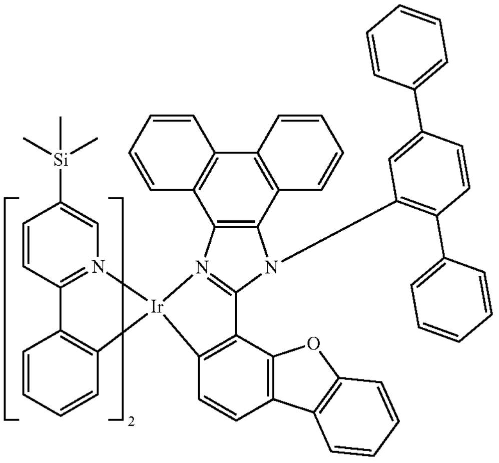

-continued
2258
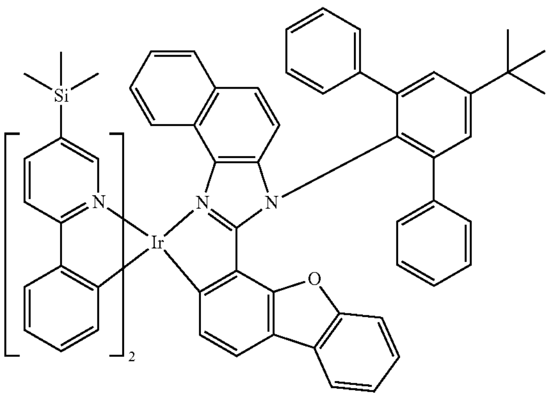
2259
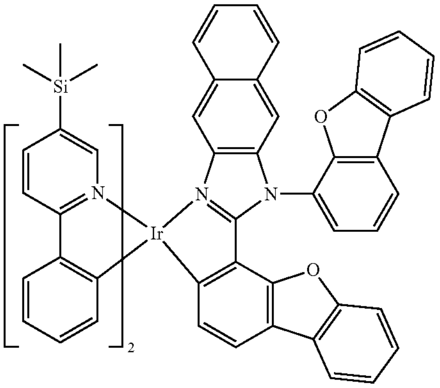
2260
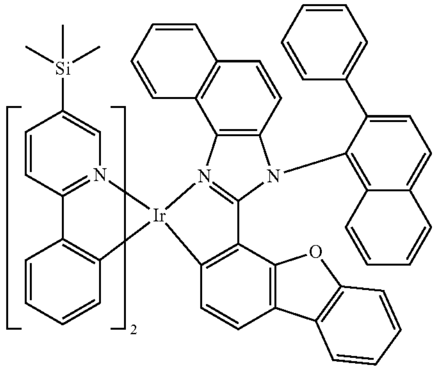
2261
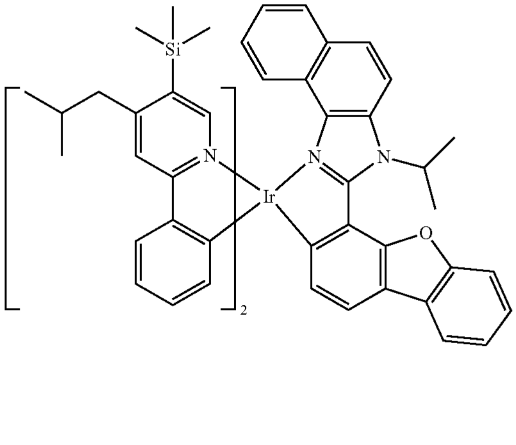
-continued
2262
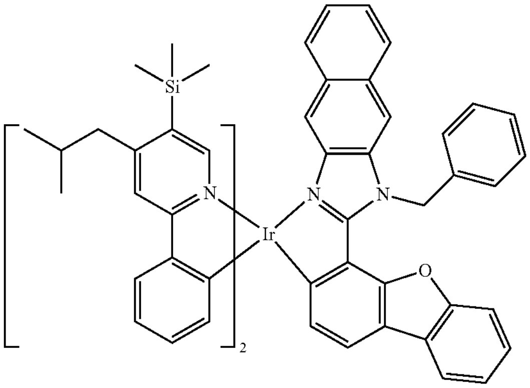
2263
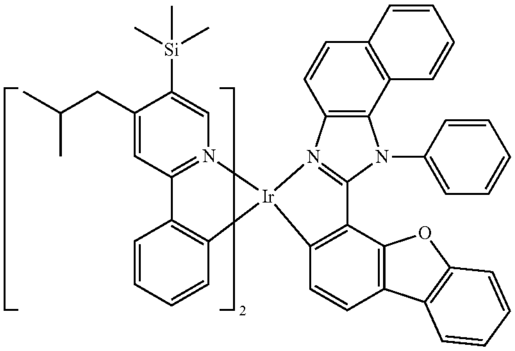
2264
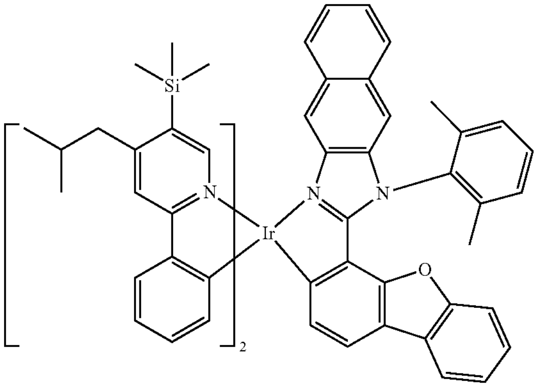
2265
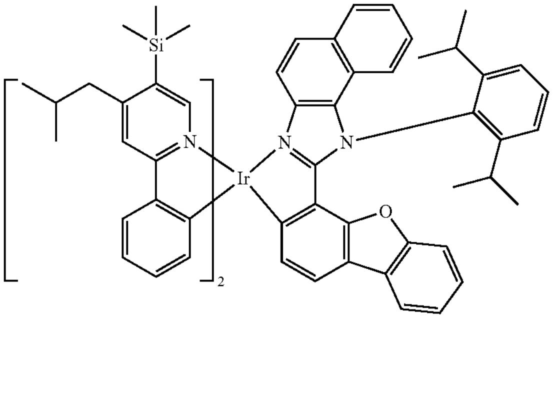

-continued
2266
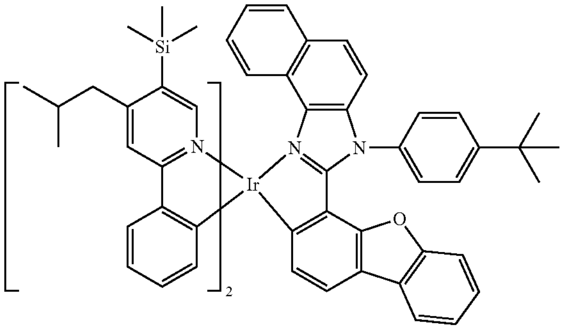
2267
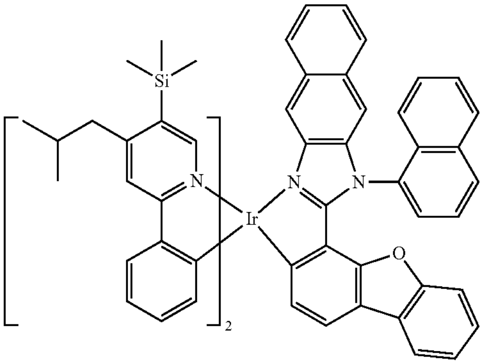
2268
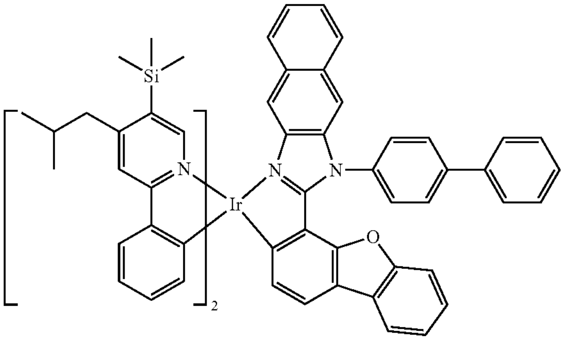
2269
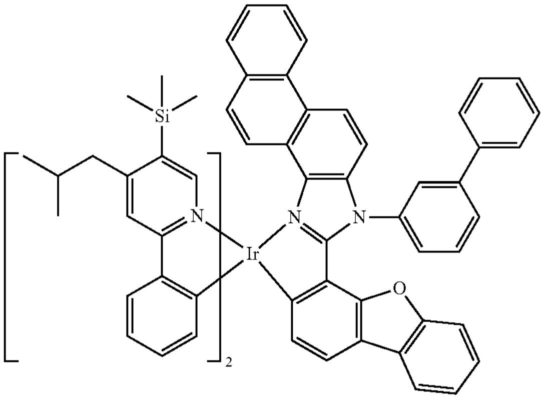
-continued
2270
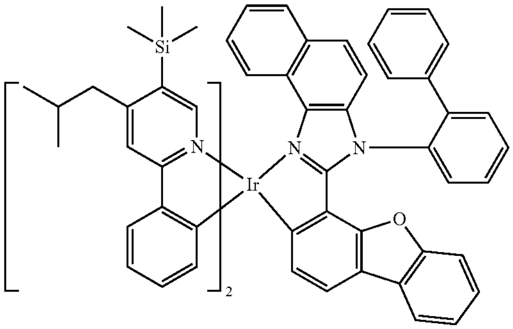
2271
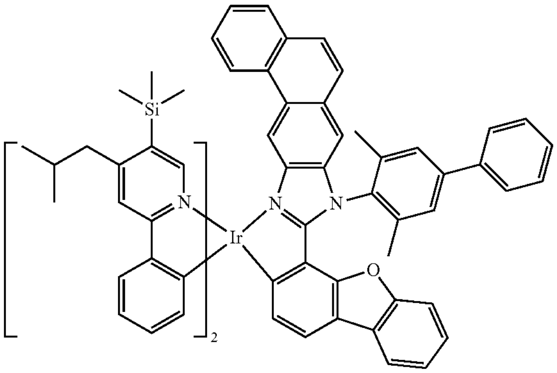
2272
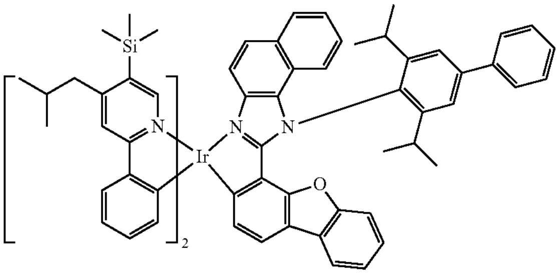
2273
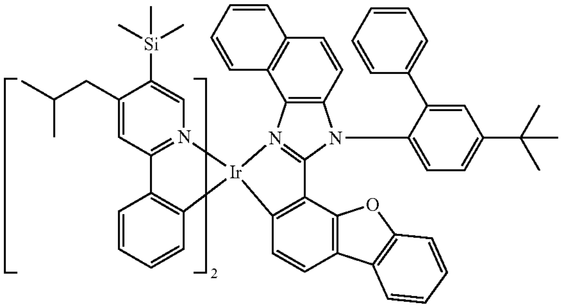

-continued
2274
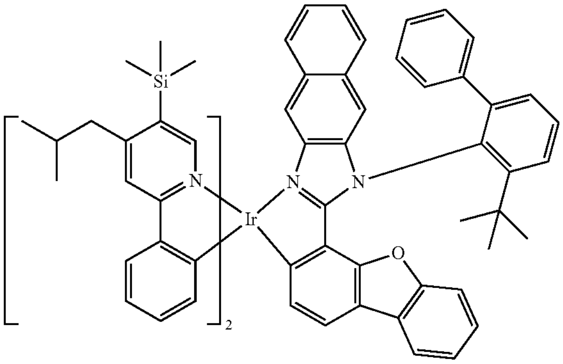
2275
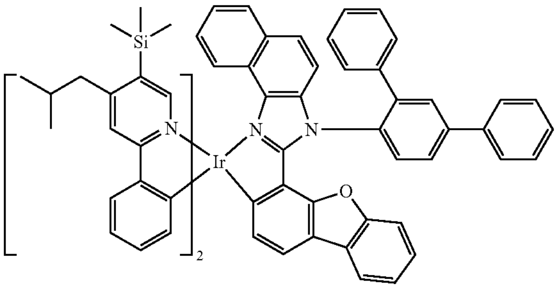
2276
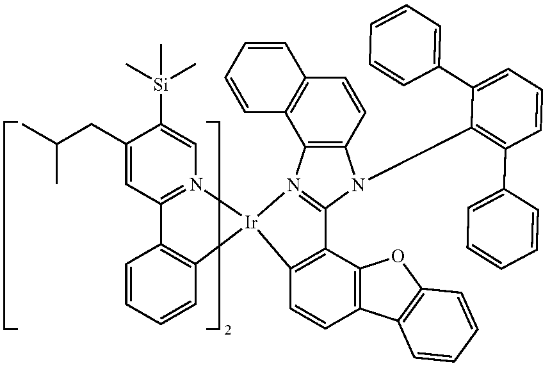
2277
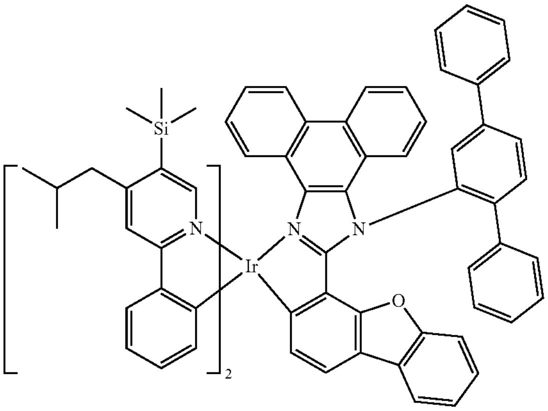
-continued
2278
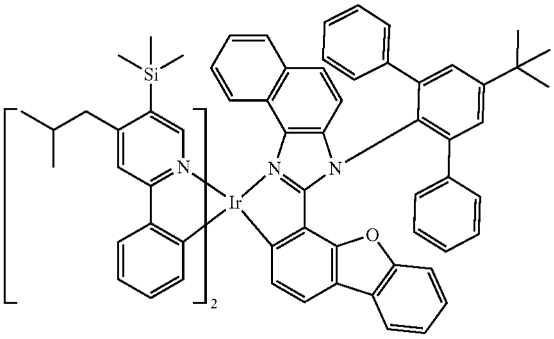
2279
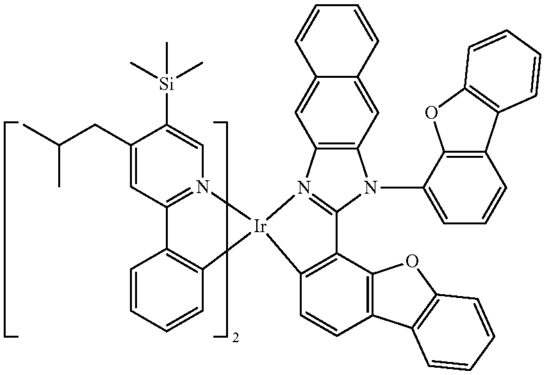
2280
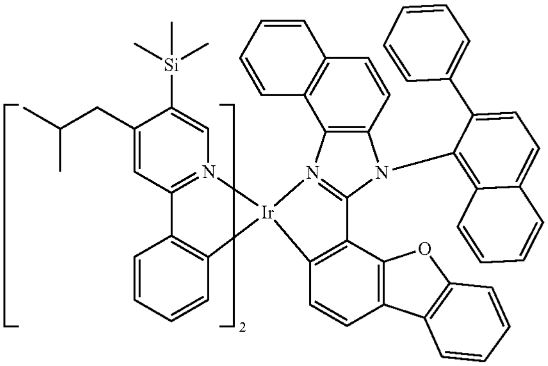
2281
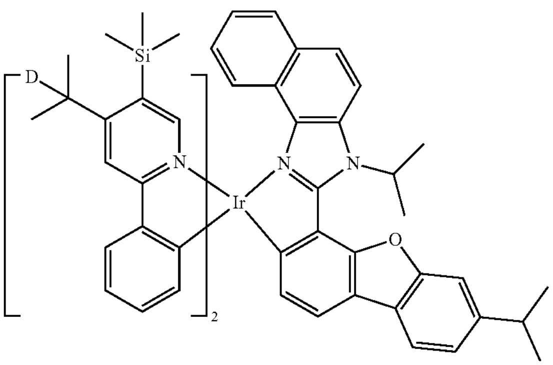

-continued
2282
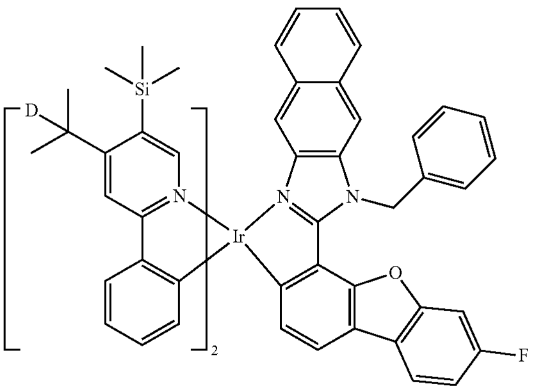
2283
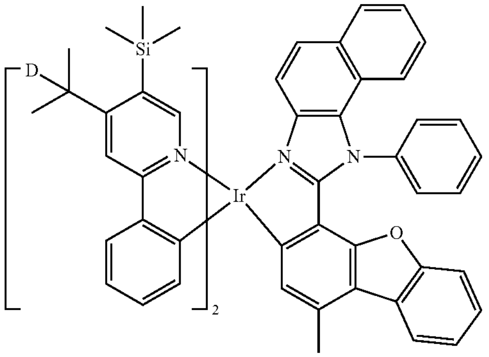
2284
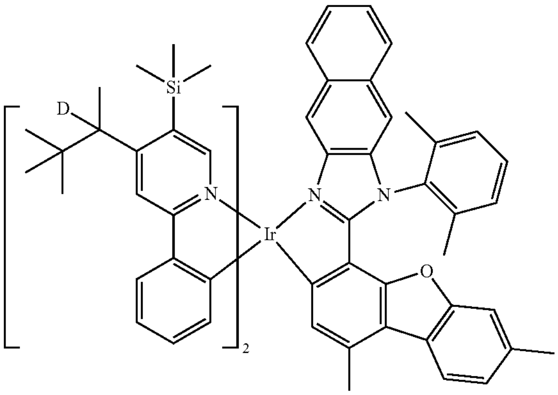
2285
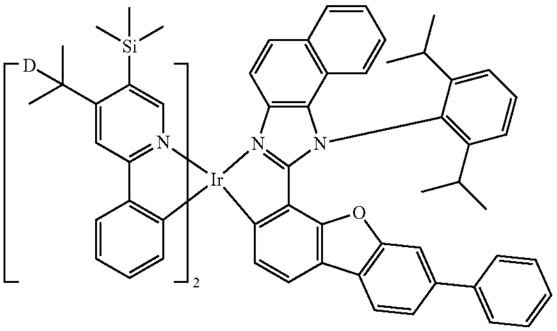
-continued
2286
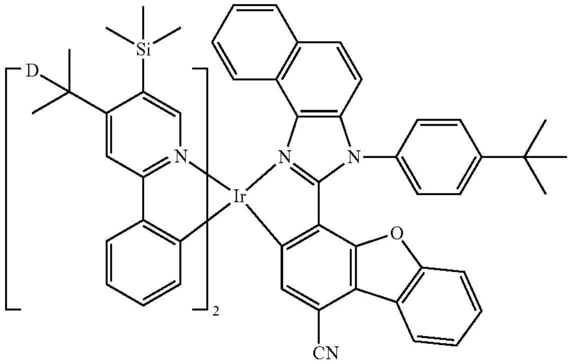
2287
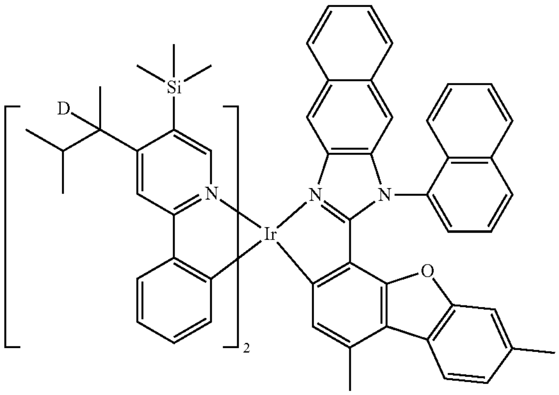
2288
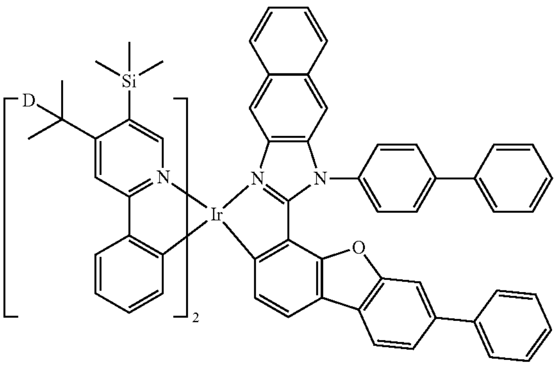

2289
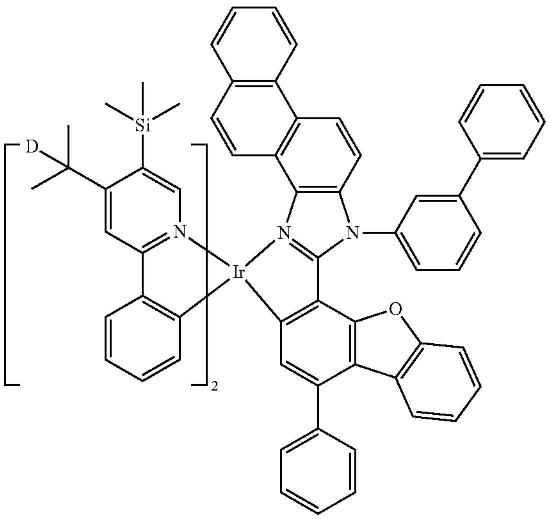
2290
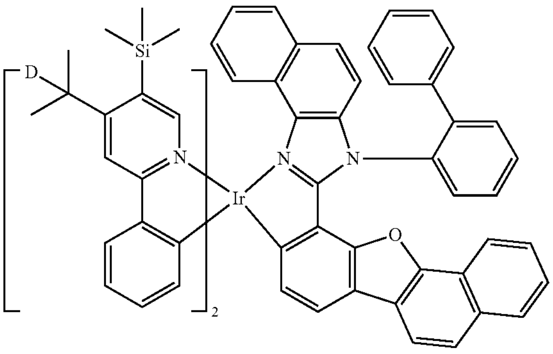
2291
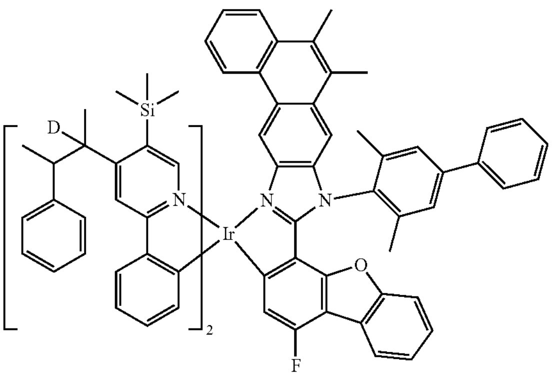
2292
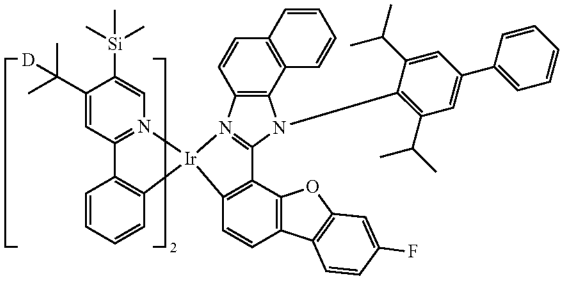
2293
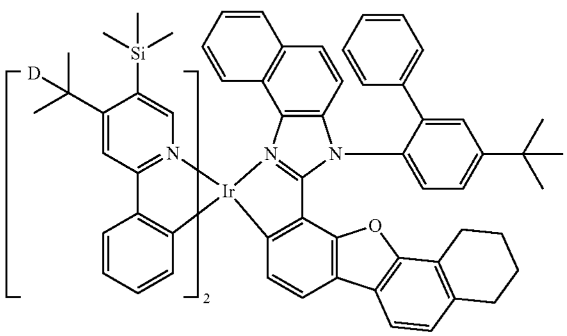
2294
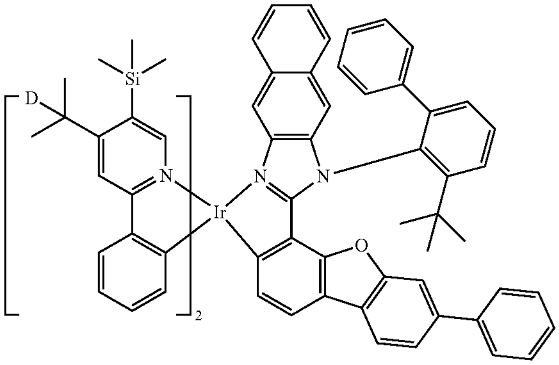
2295
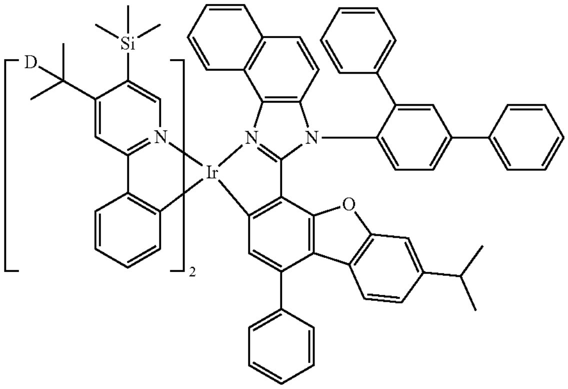
2296
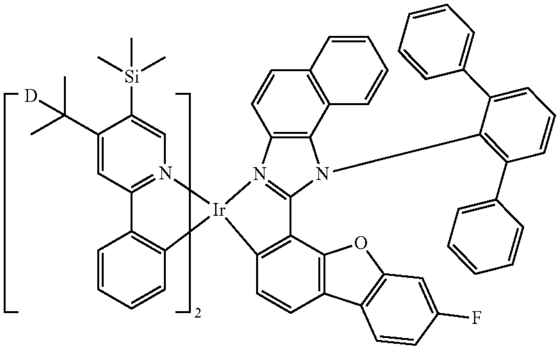

-continued
2297
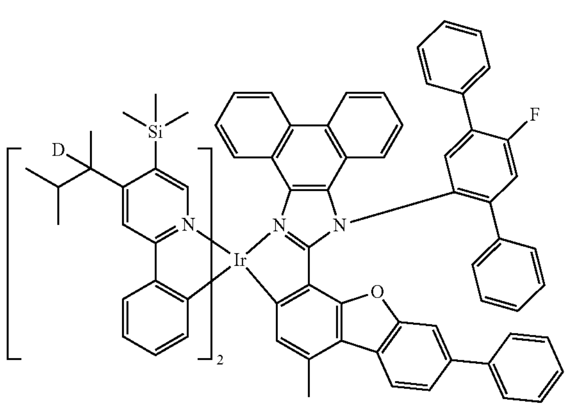
2298
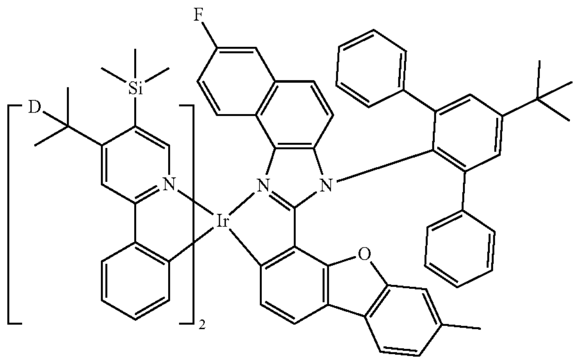
2299
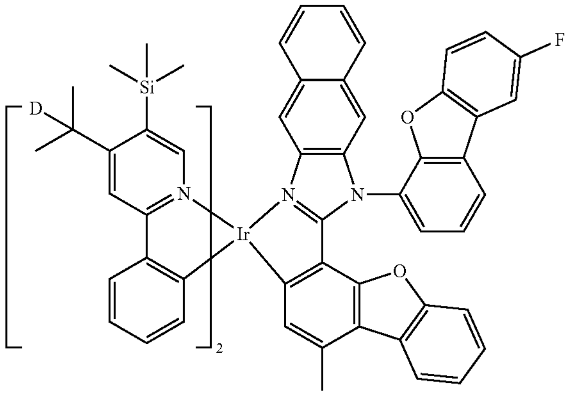
2300
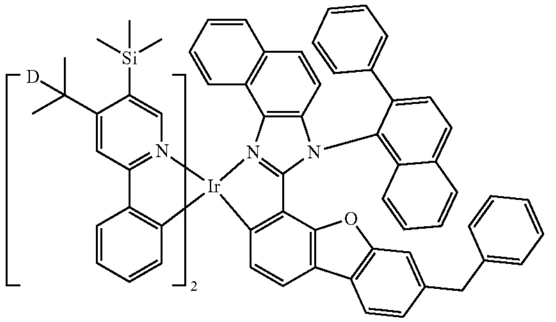
-continued
2301
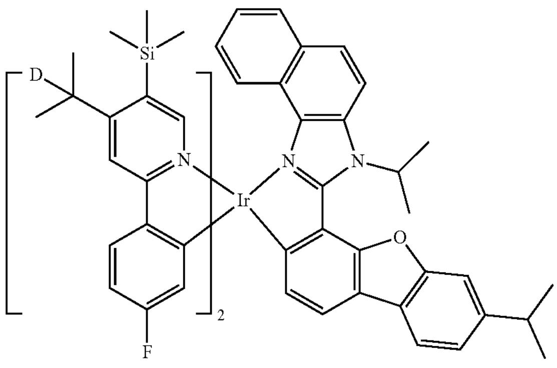
2302
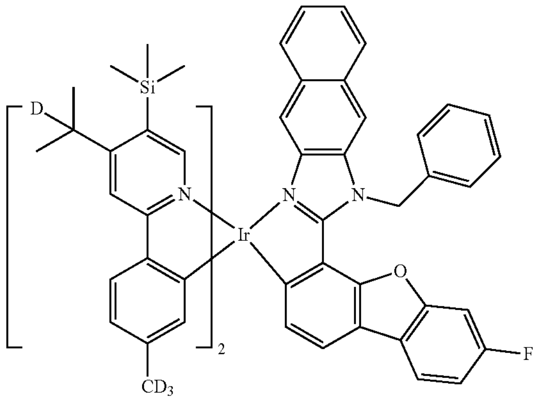
2303
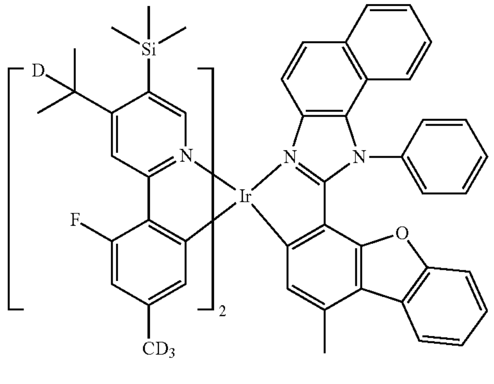
2304
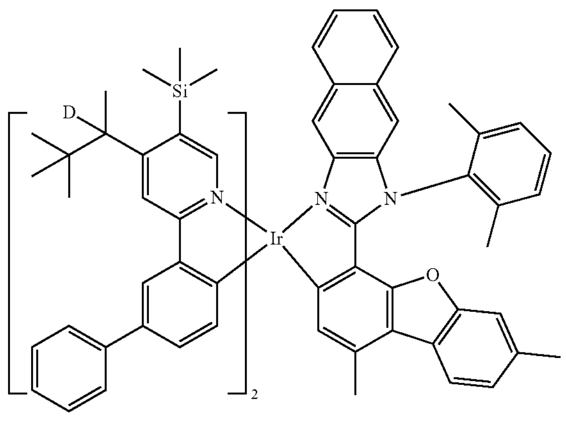

-continued
2305
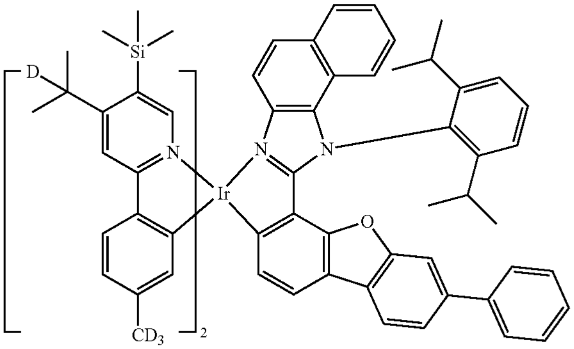
2306
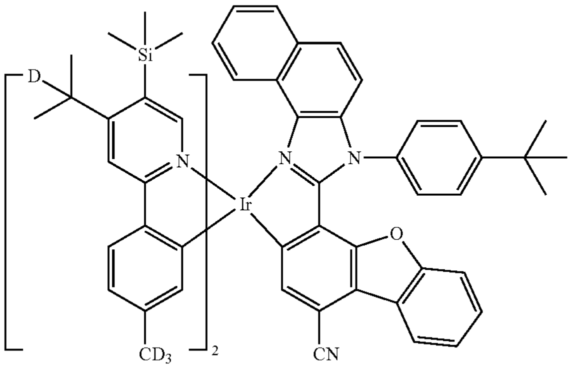
2307
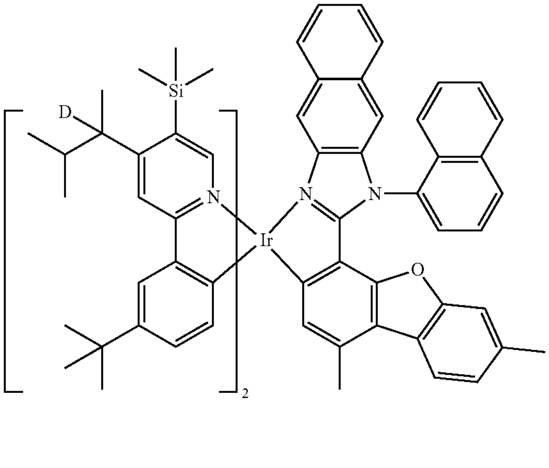
2308
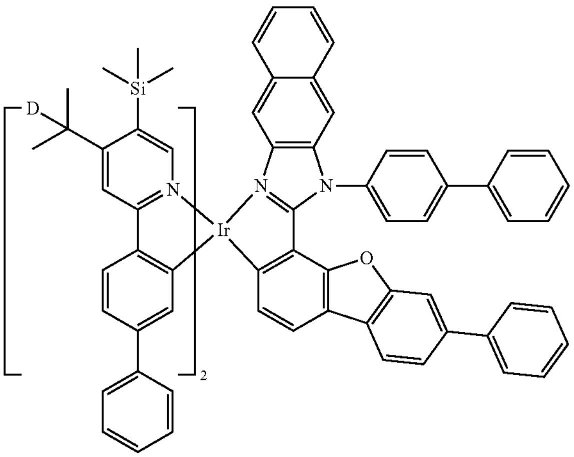
2309
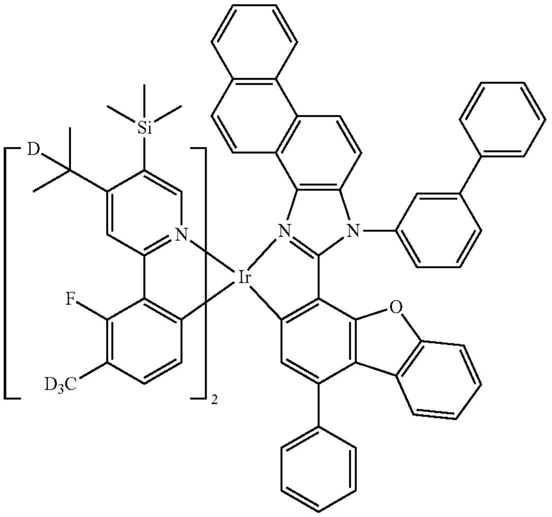
2310
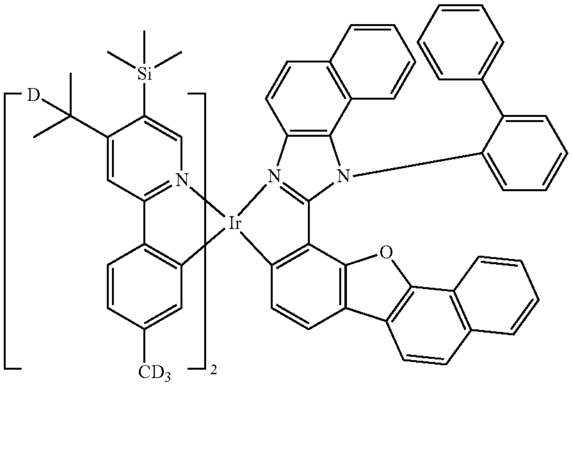

-continued
2311
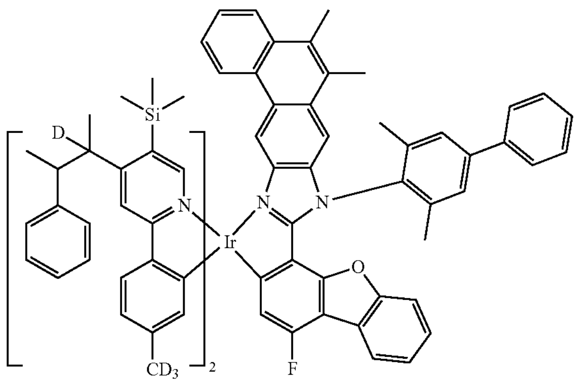
2312
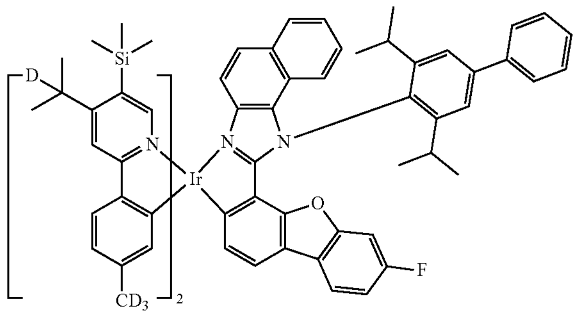
2313
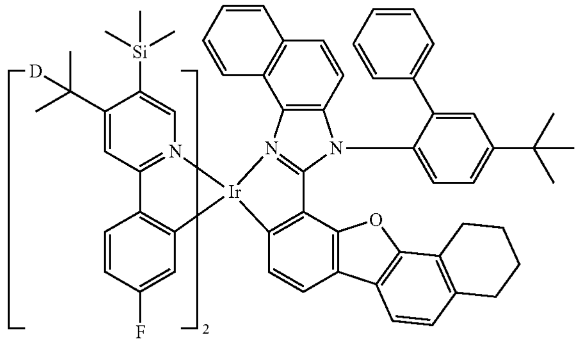
2314
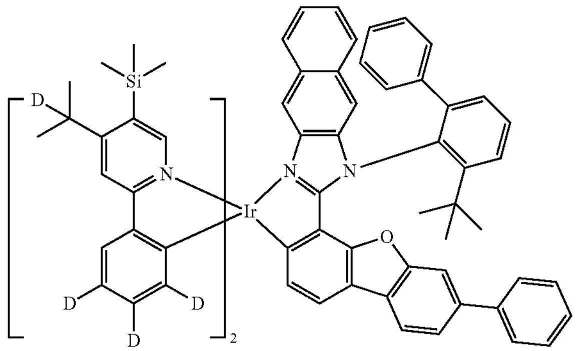
-continued
2315
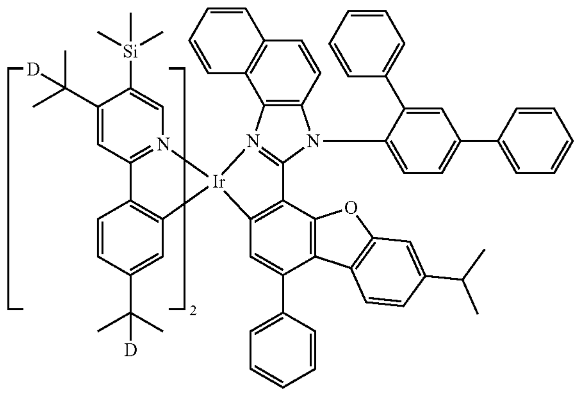
2316
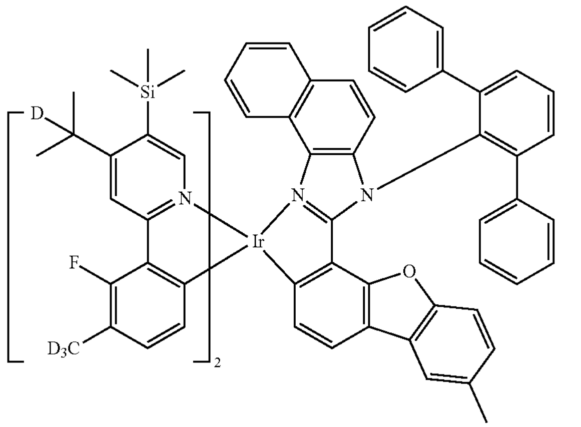
2317
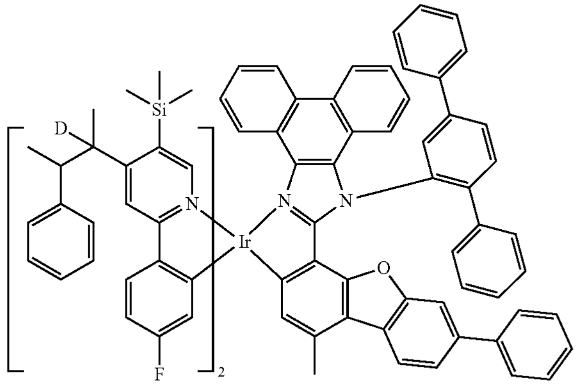
2318
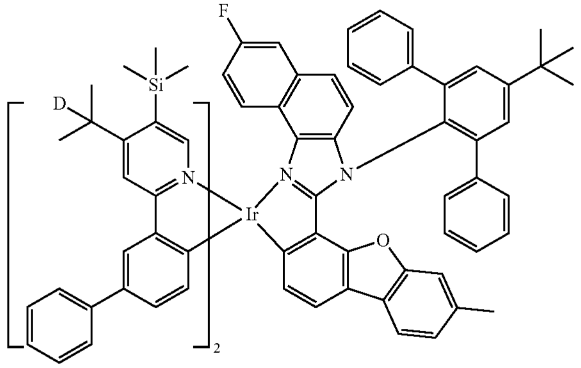

-continued
2319
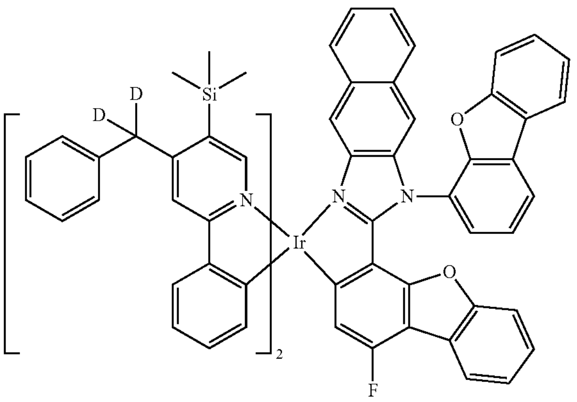
2320
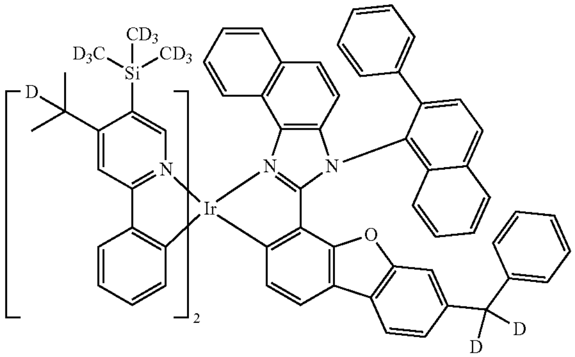
2321
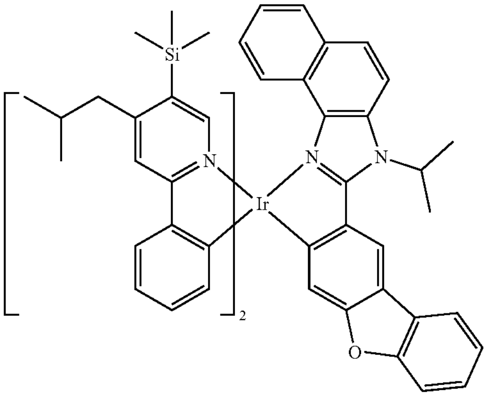
-continued
2322
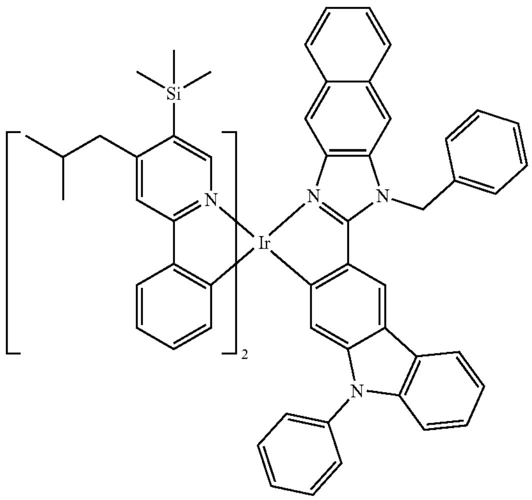
2323
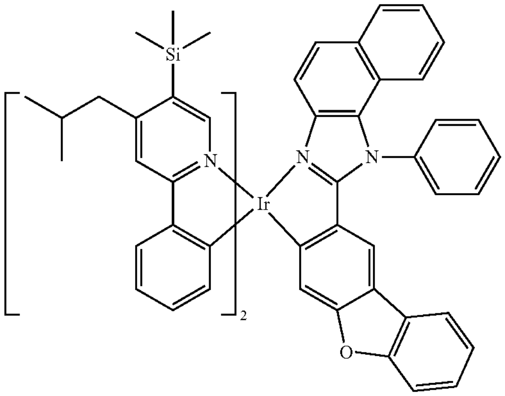
2324
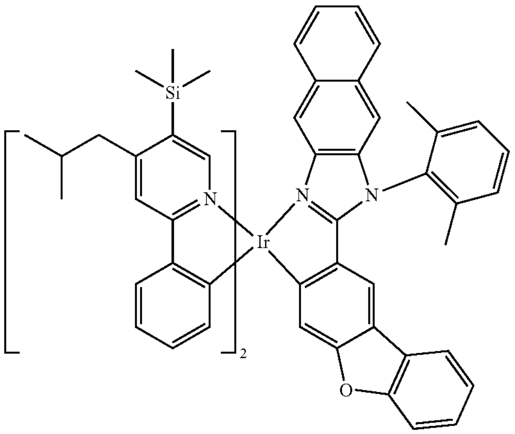

-continued
2325
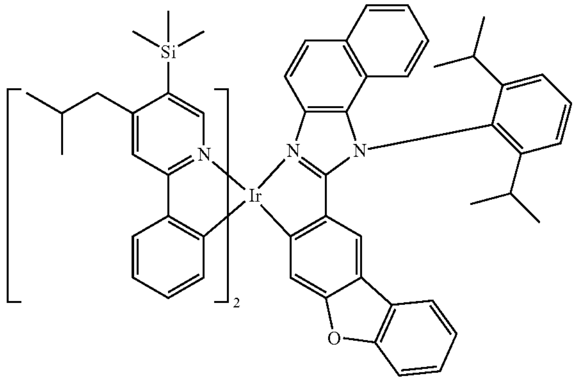
2326
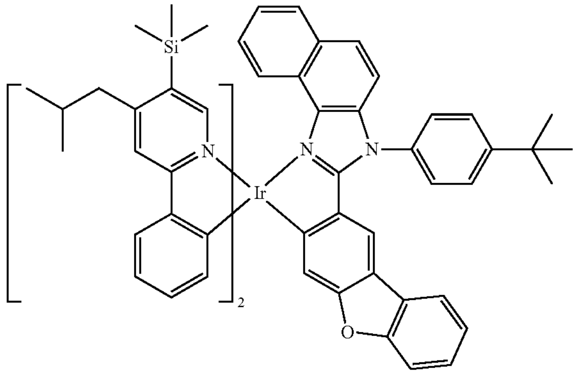
2327
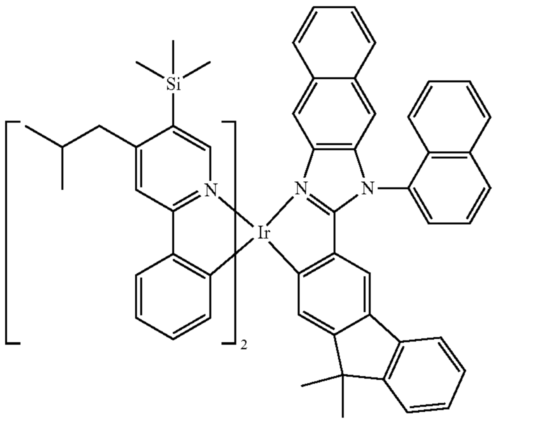
2328
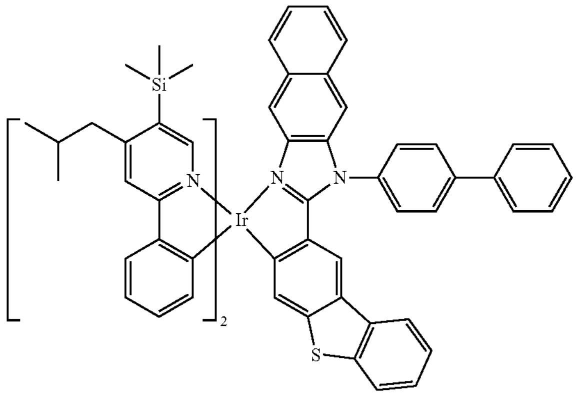
-continued
2329
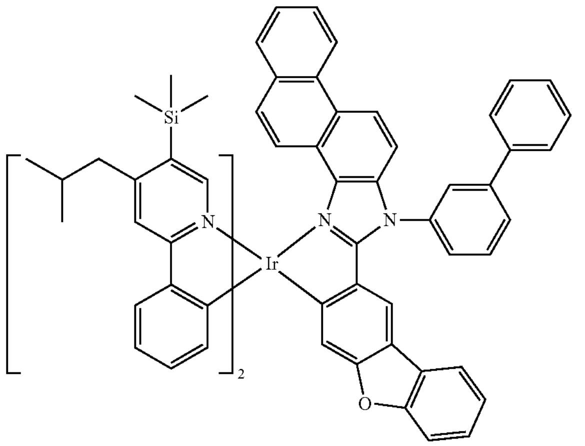
2330
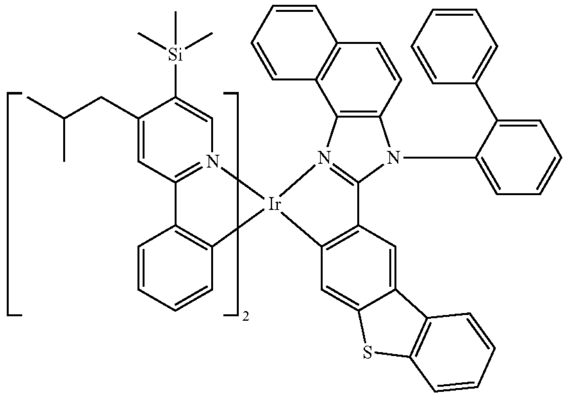
2331
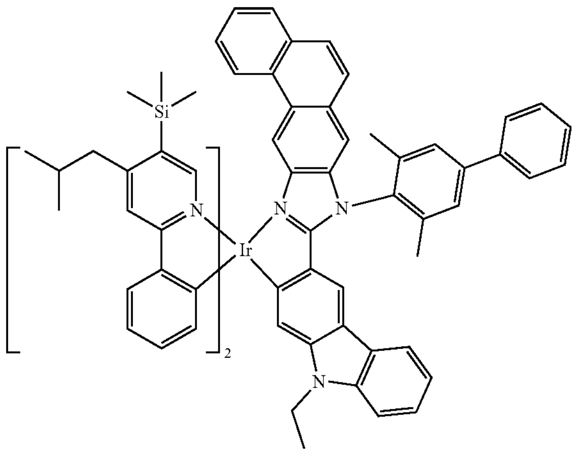

2332
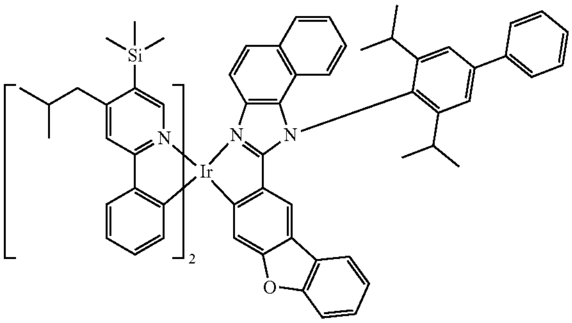
2333
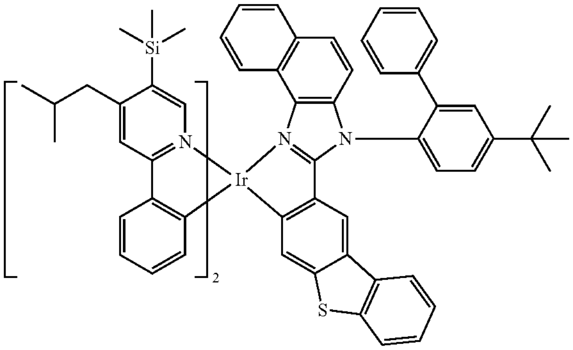
2334
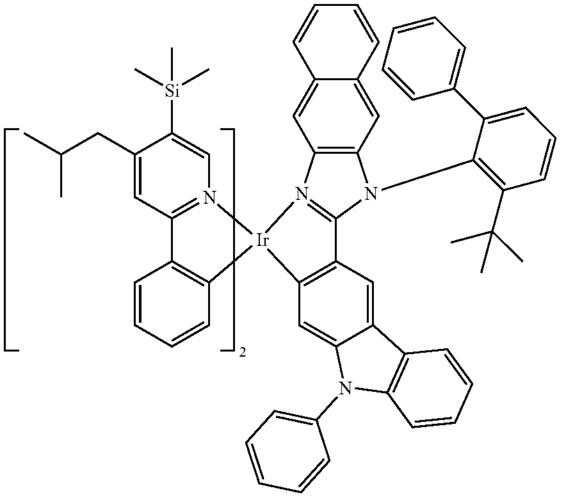
2335
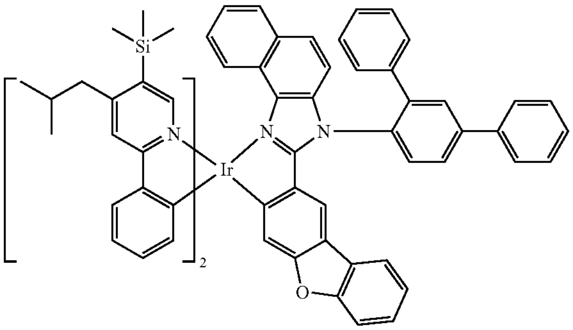
2336
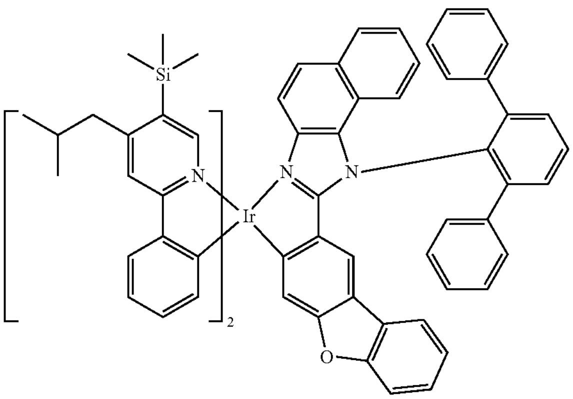
2337
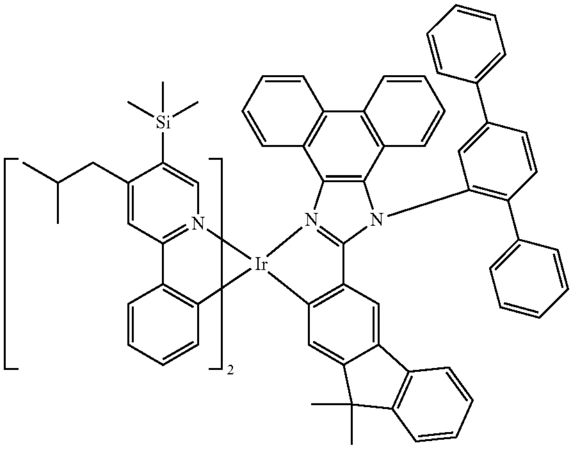
2338
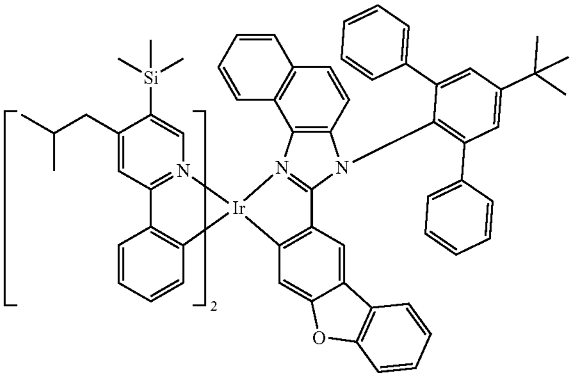

-continued
2339
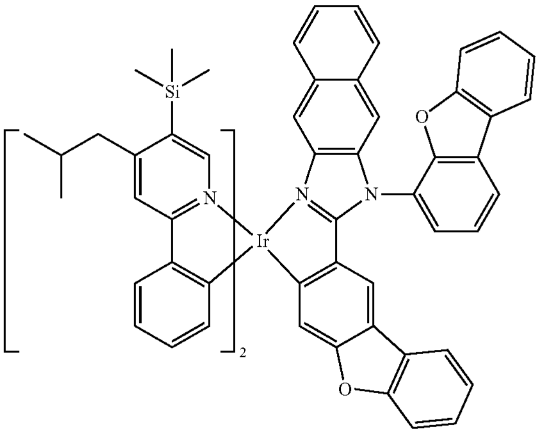
2340
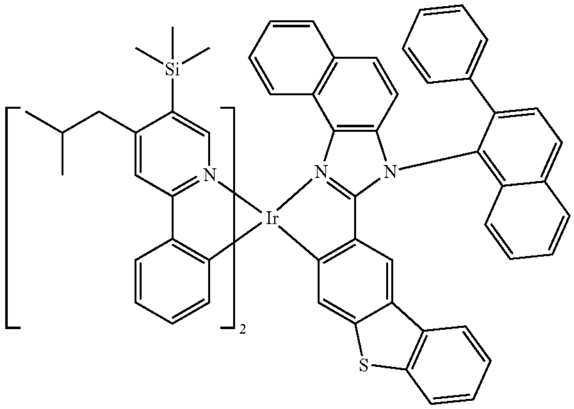
2341
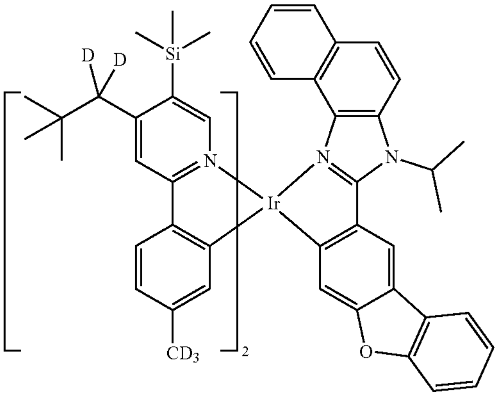
-continued
2342
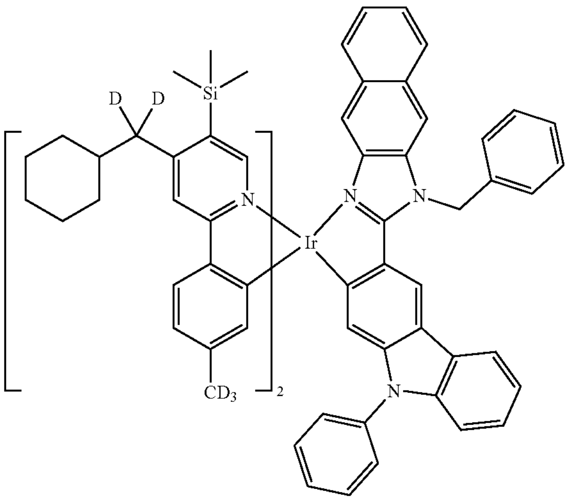
2343
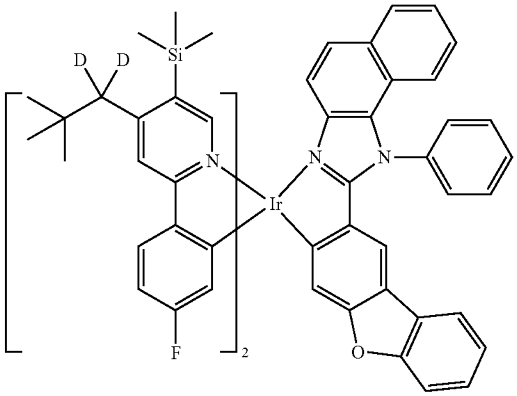
2344
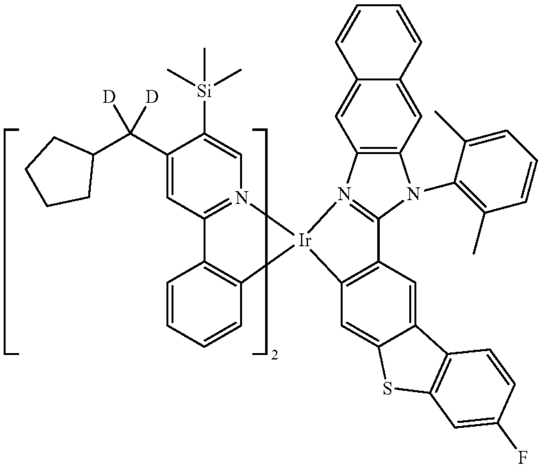

-continued
2345
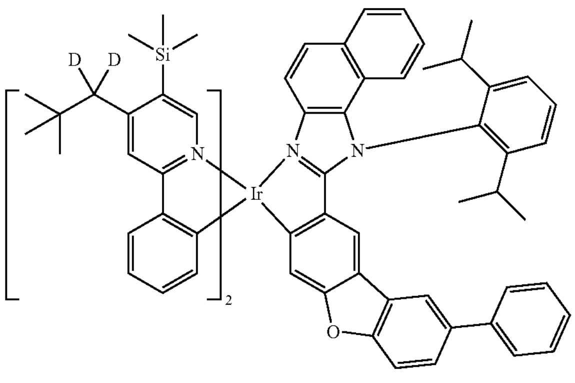
2346
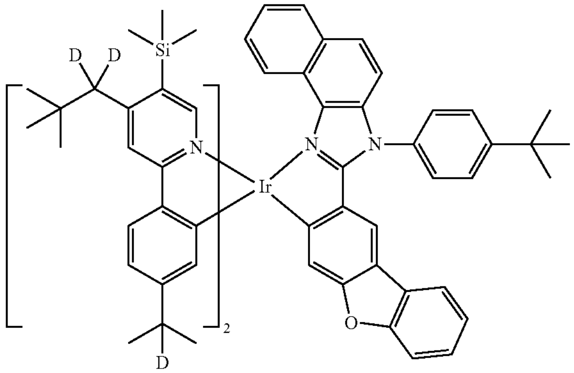
2347
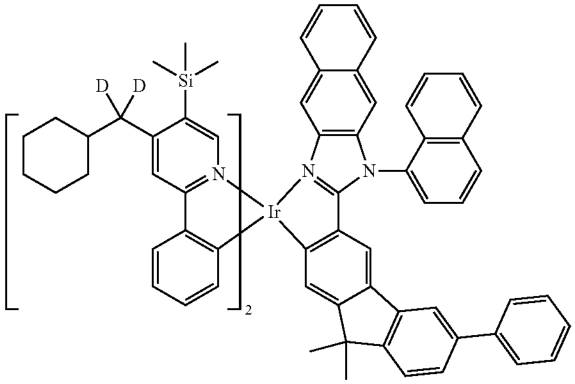
2348
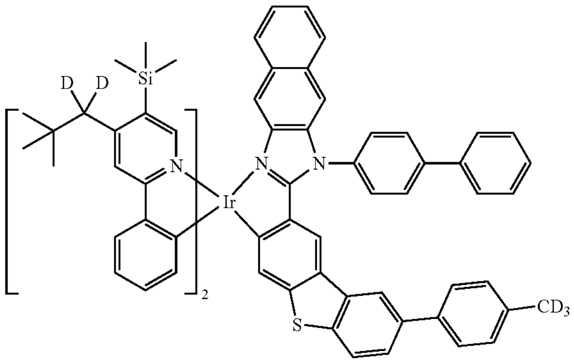
-continued
2349
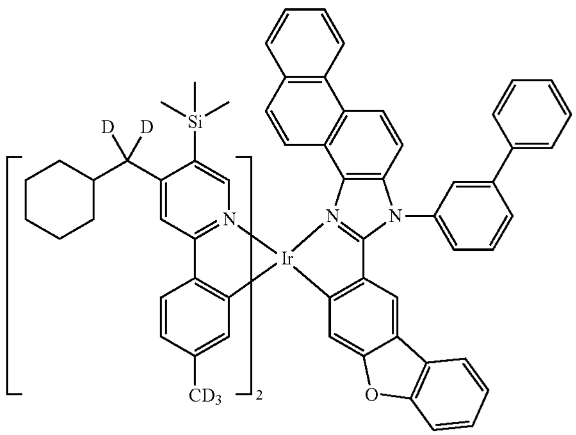
2350
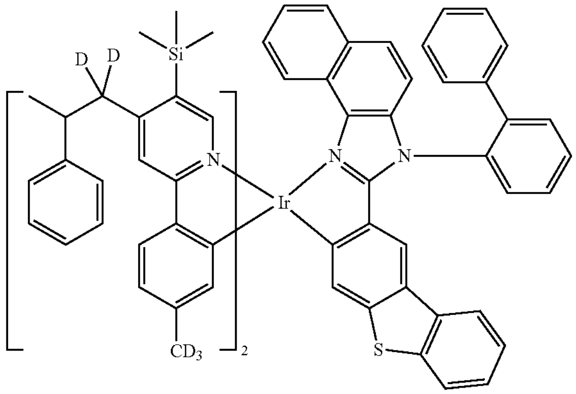
2351
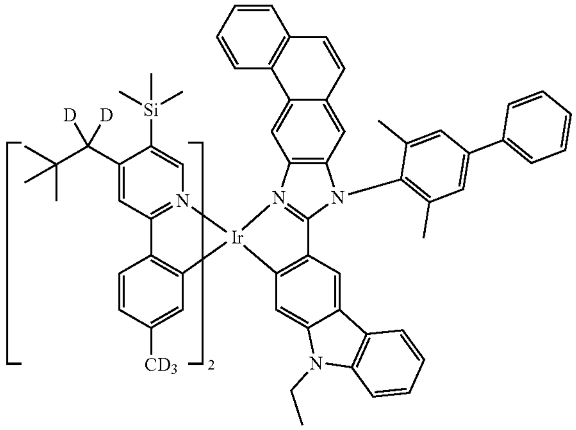
2352
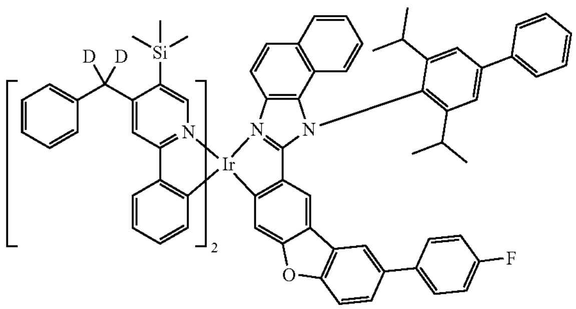

-continued
2353
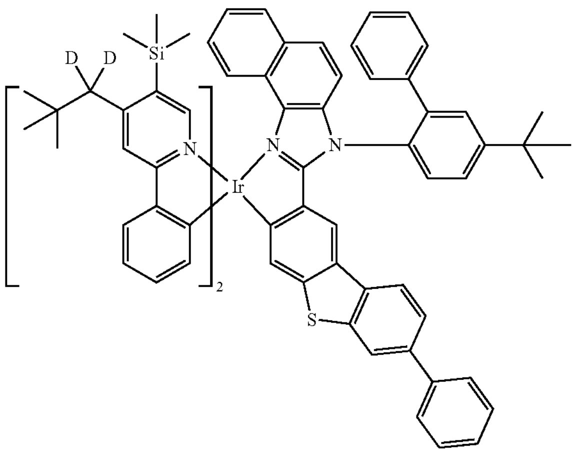
2354
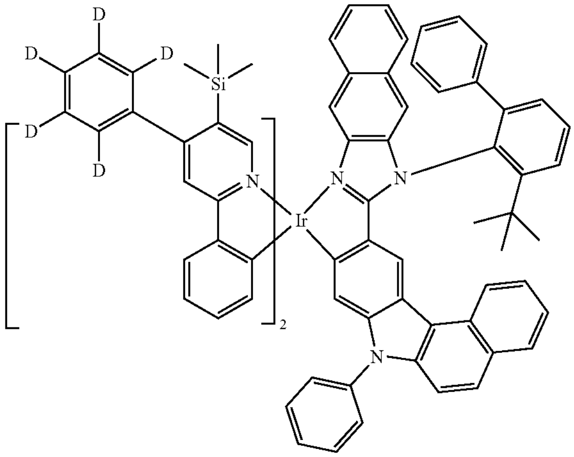
2355
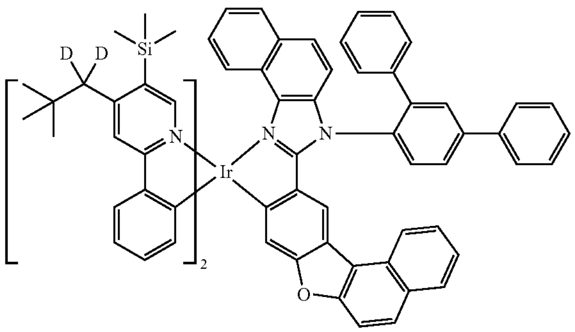
-continued
2356
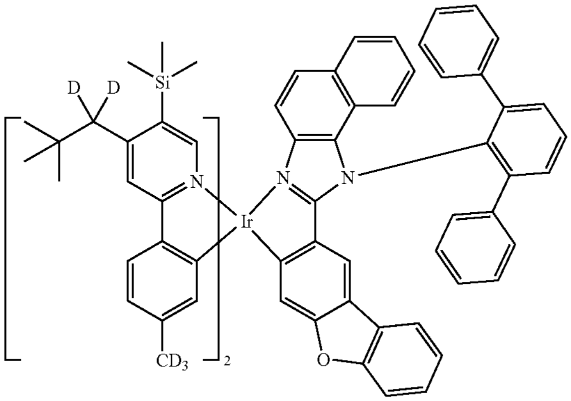
2357
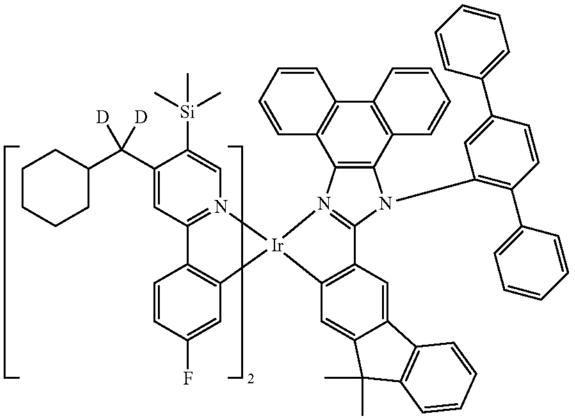
2358
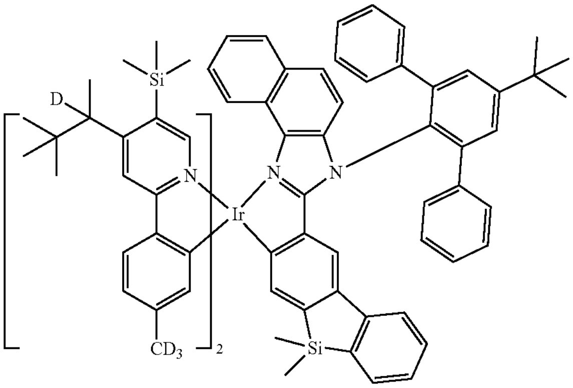

-continued
2359
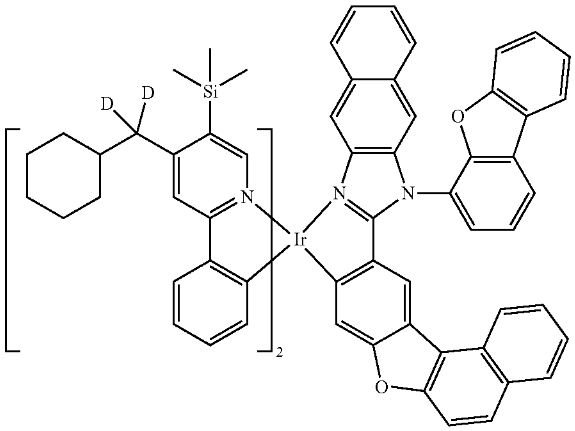
2360
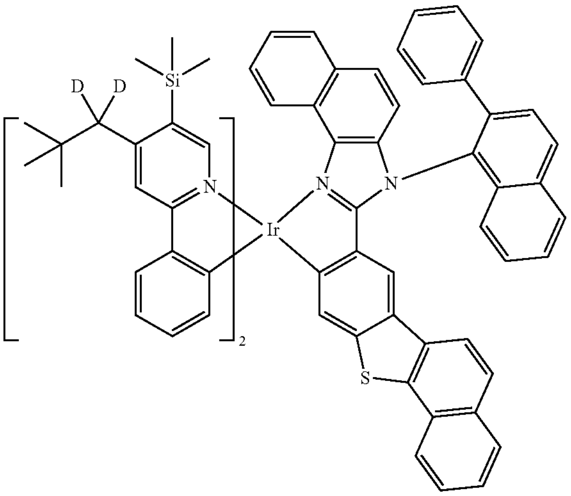
2361
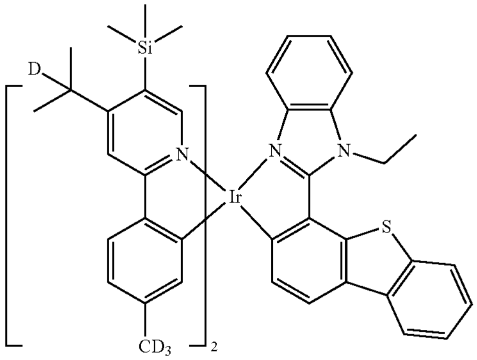
-continued
2362
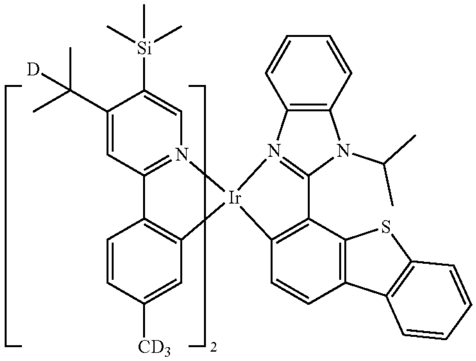
2363
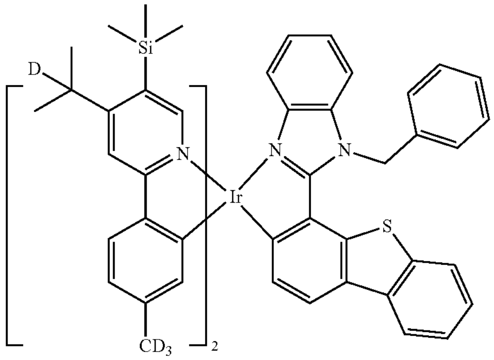
2364
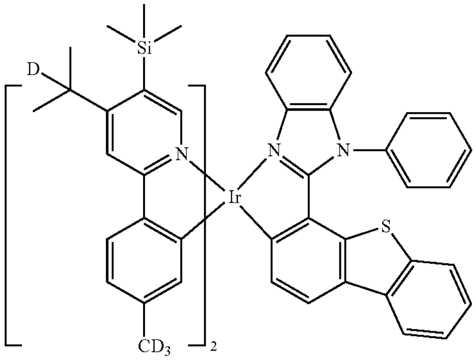
2365
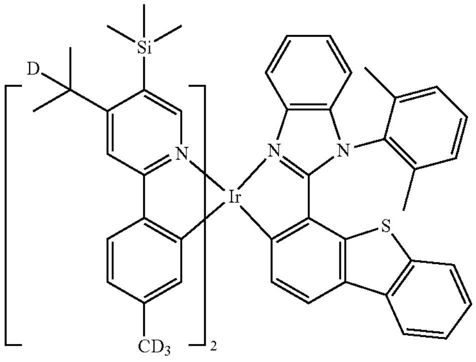

-continued
2366
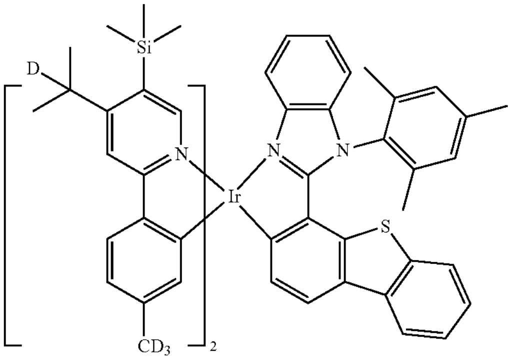
2367
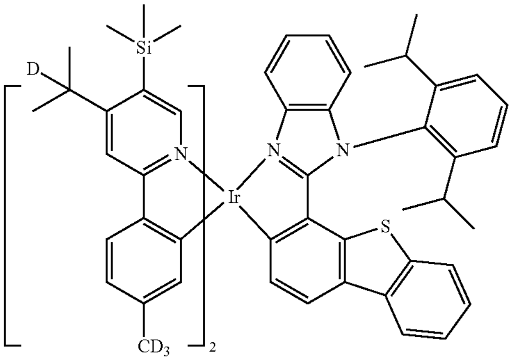
2368
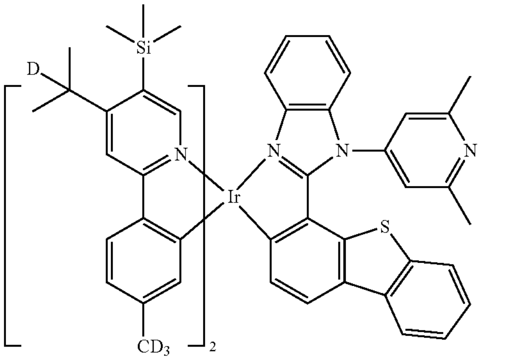
2369
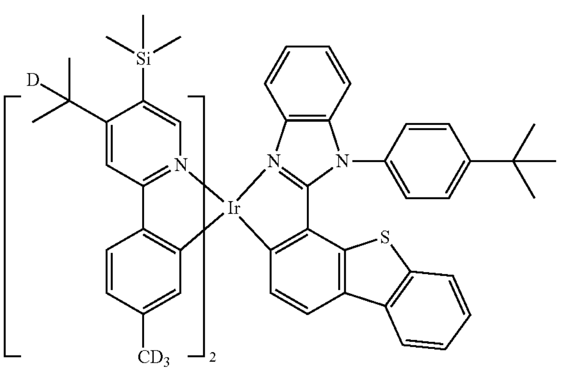
-continued
2370
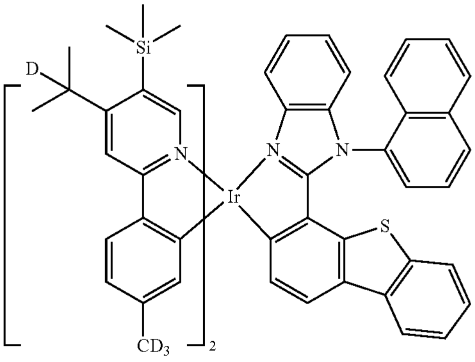
2371
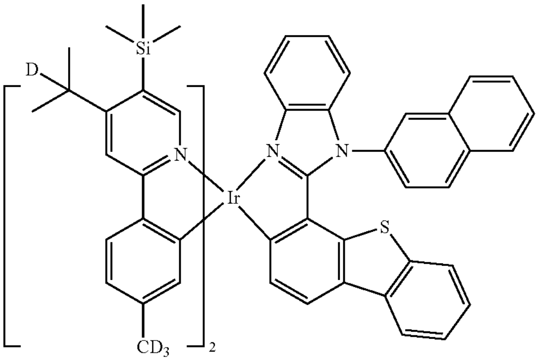
2372
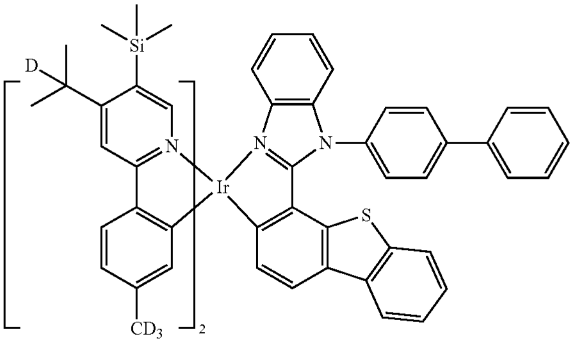
2373
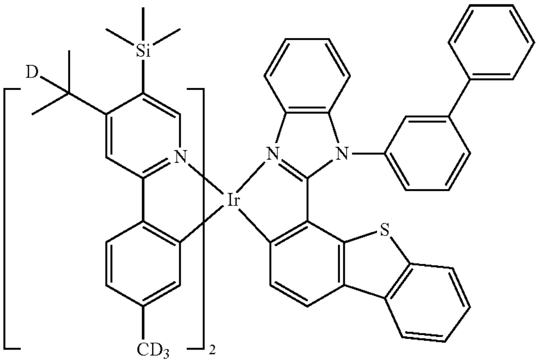

-continued
2374
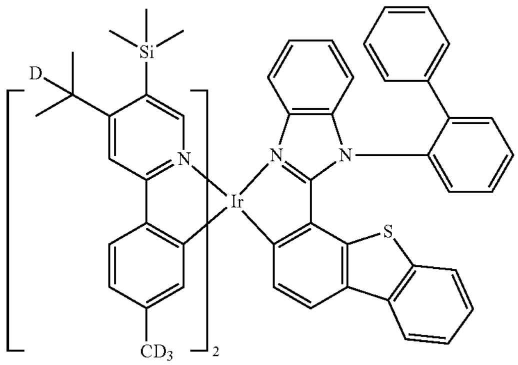
2375
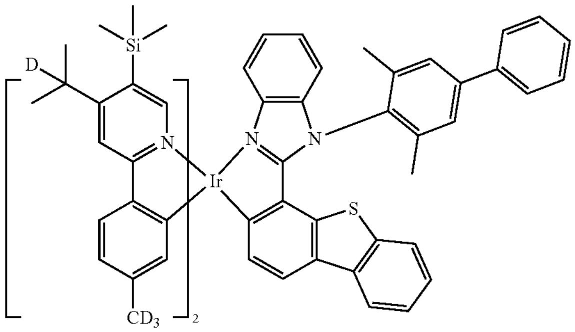
2376
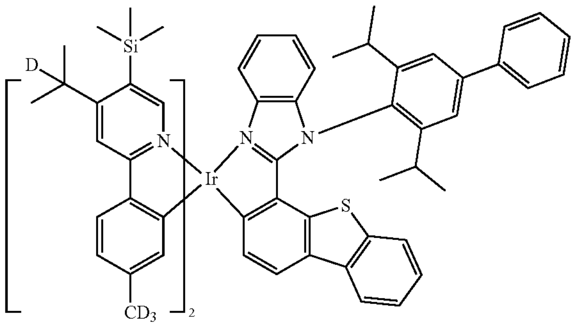
2377
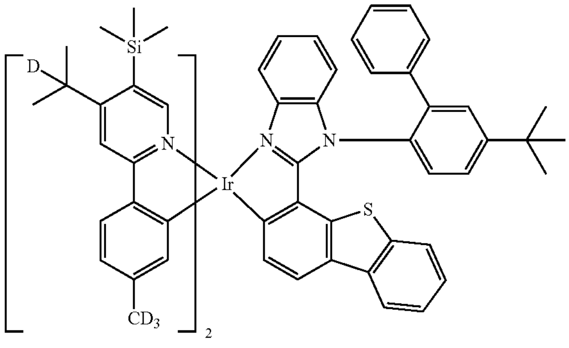
-continued
2378
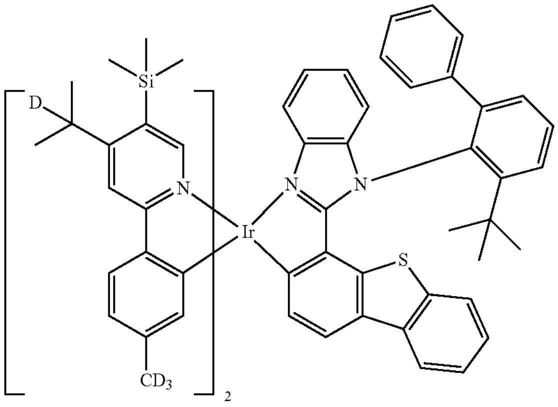
2379
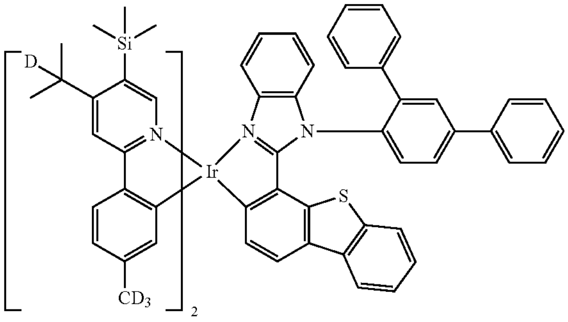
2380
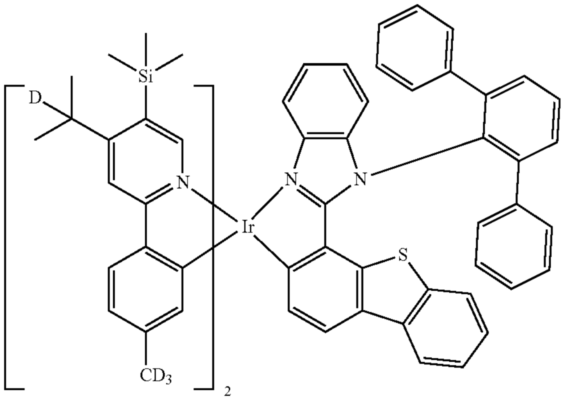

-continued
2381
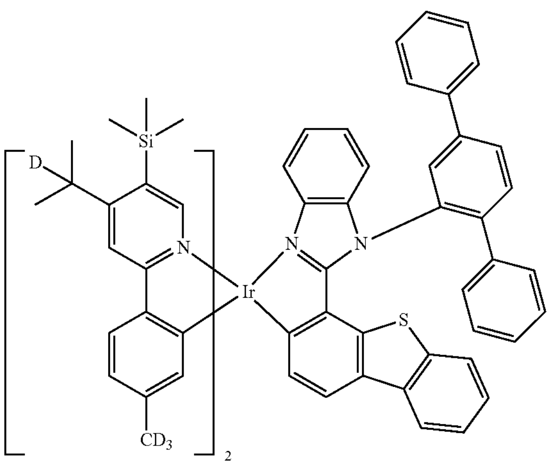
2382
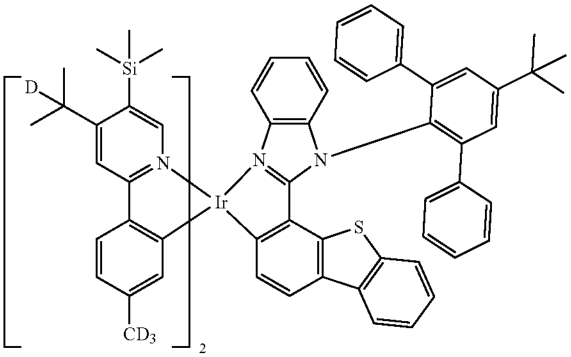
2383
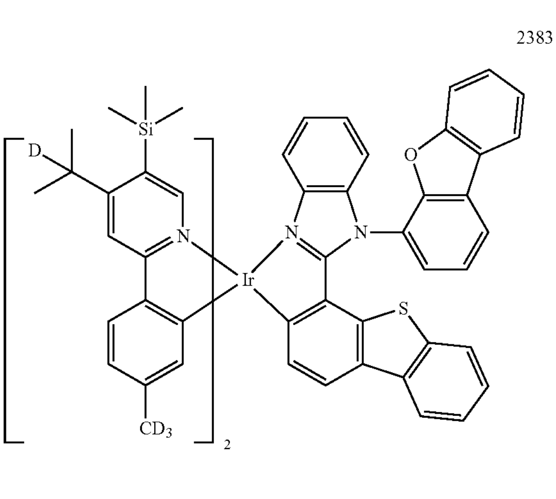
-continued
2384
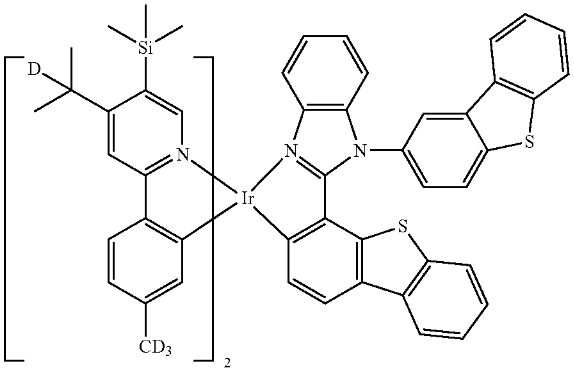
2385
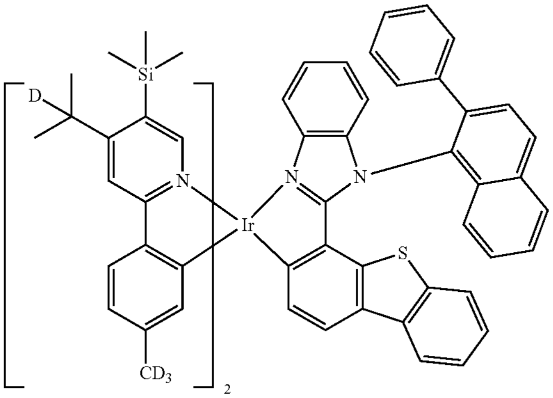
2386
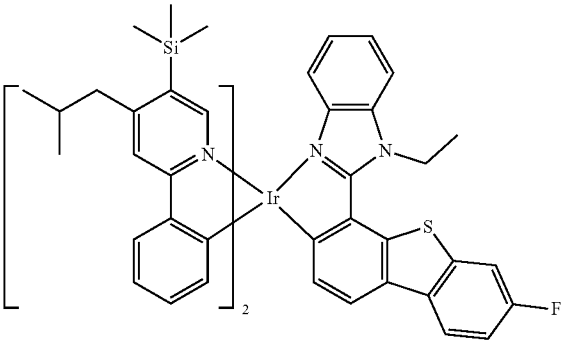
2387
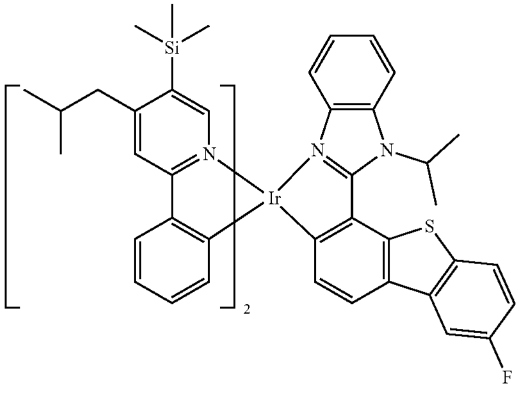

-continued
2388
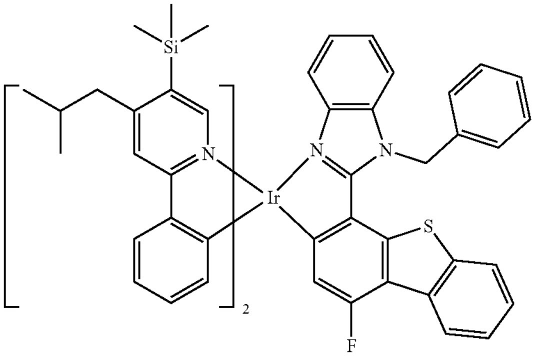
2389
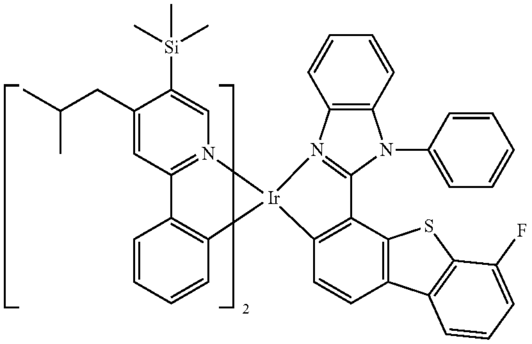
2390
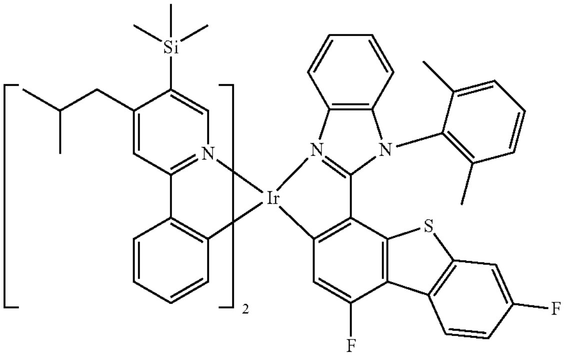
2391
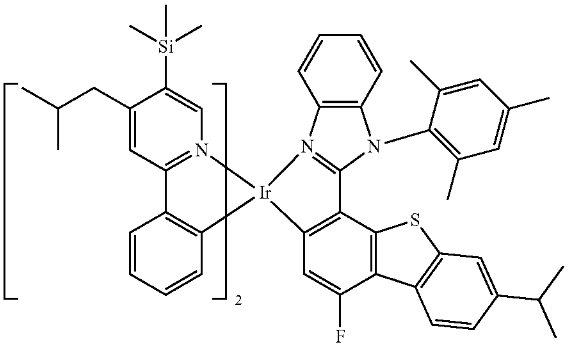
-continued
2392
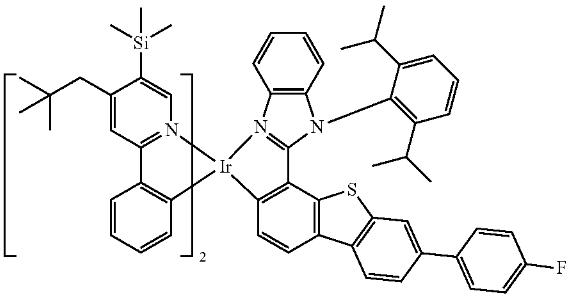
2393
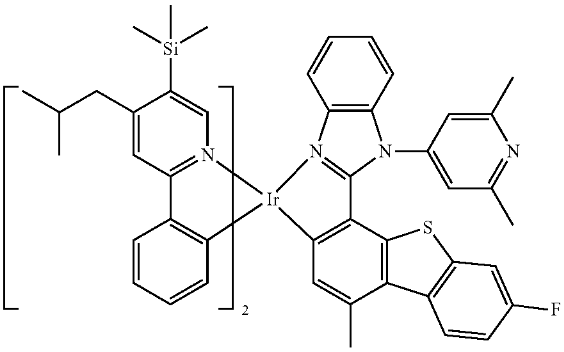
2394
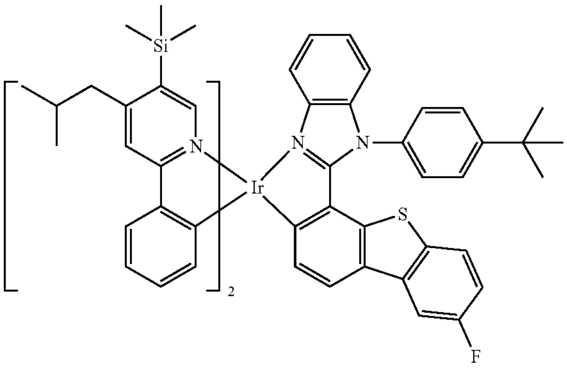
2395
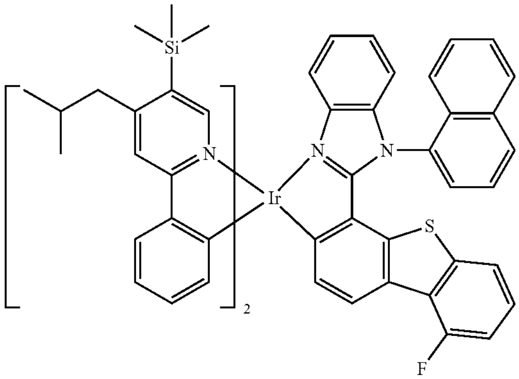

-continued
2396
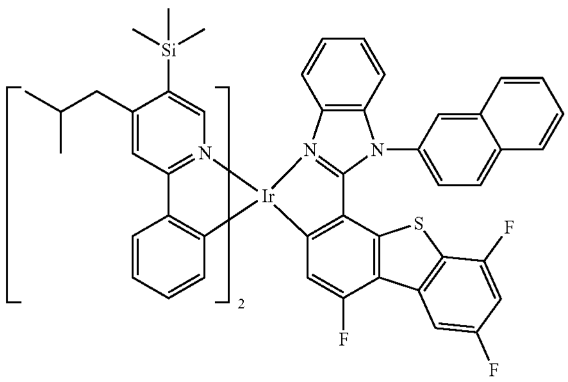
2397
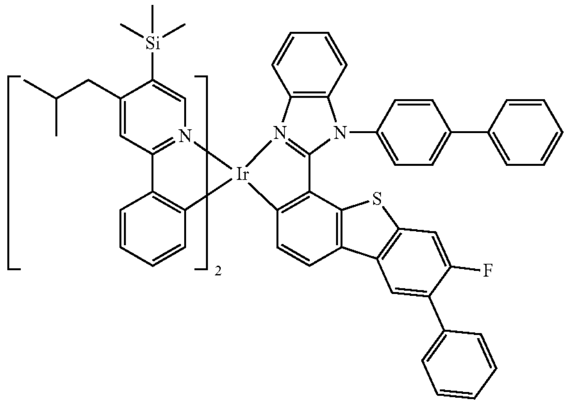
2398
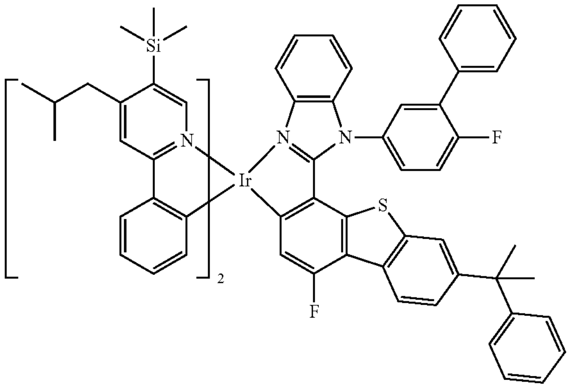
2399
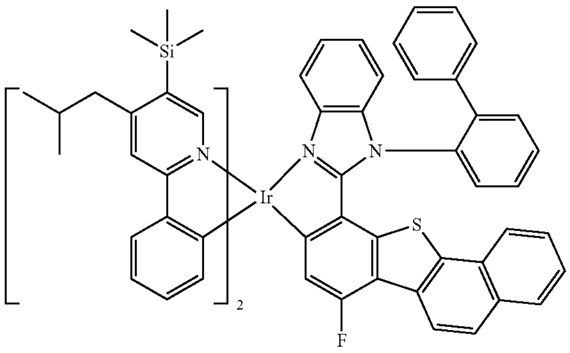
-continued
2400
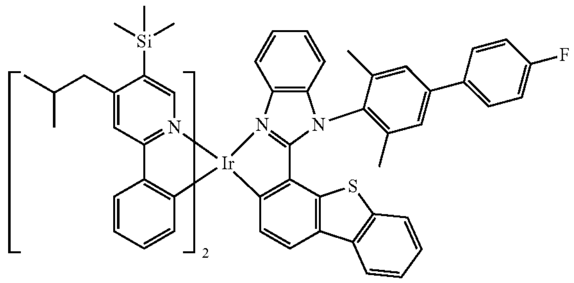
2401
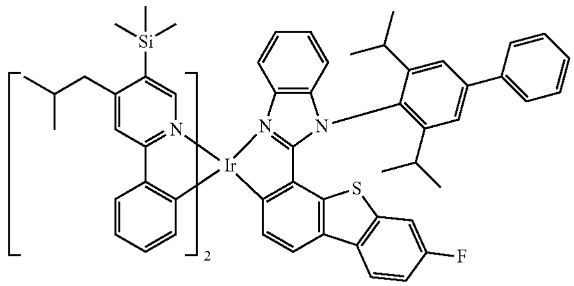
2402
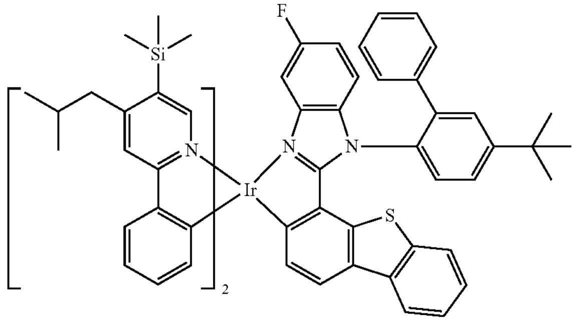
2403
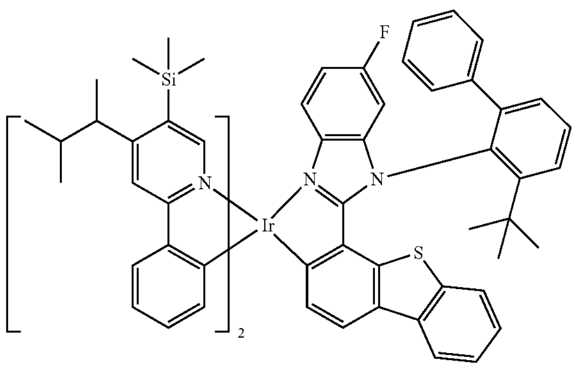

-continued
2404
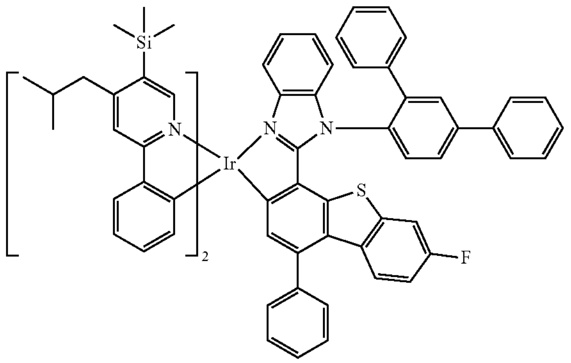
2405
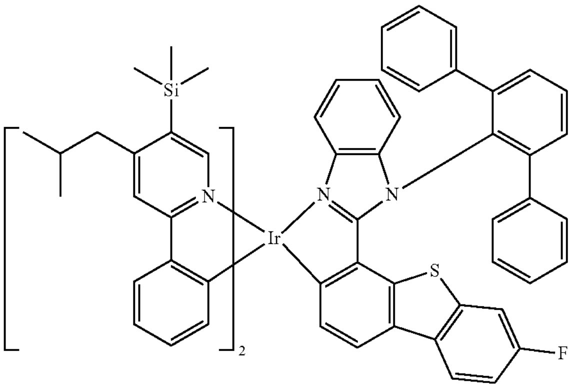
2406
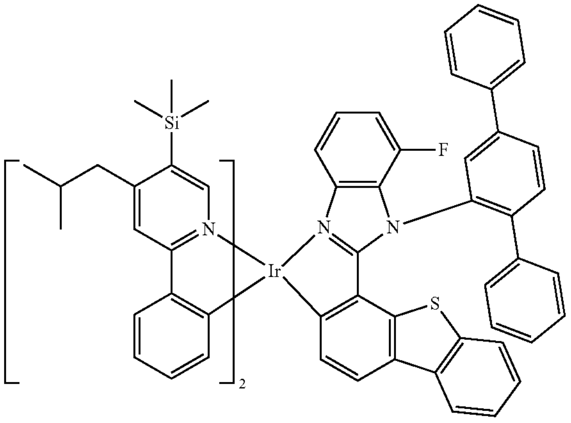
2407
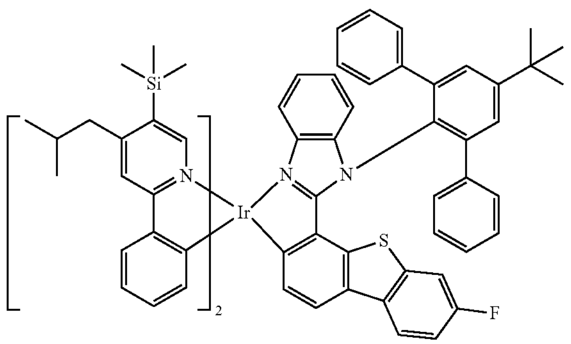
2408
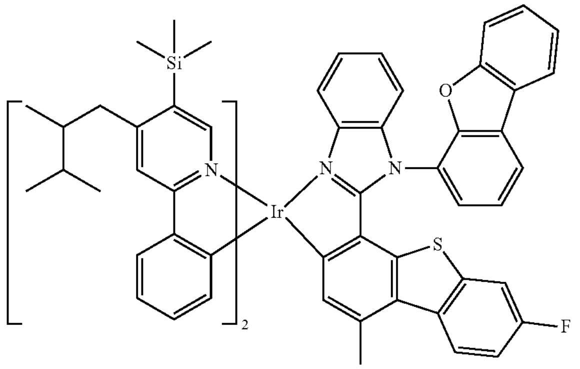
2409
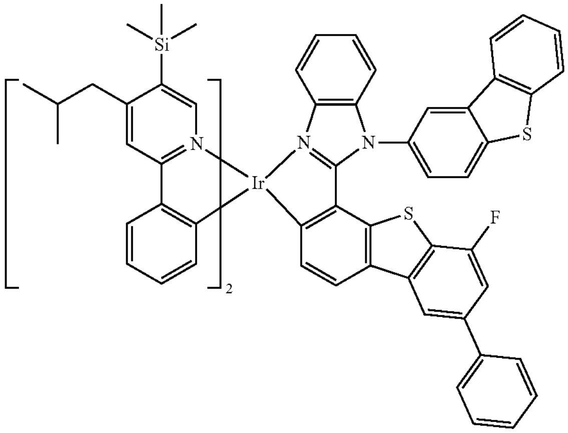
2410
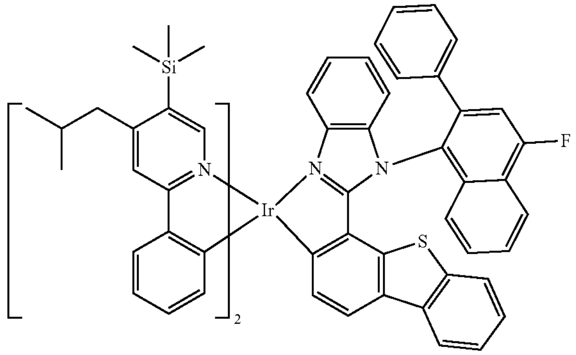

-continued
2411
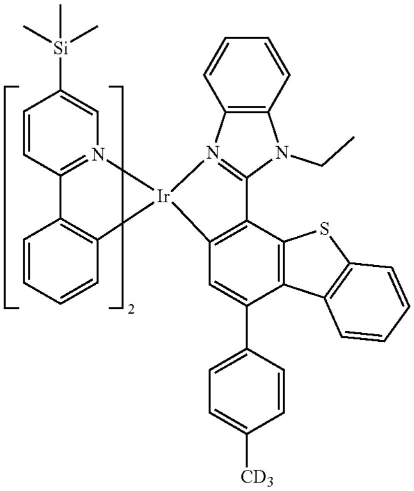
2412
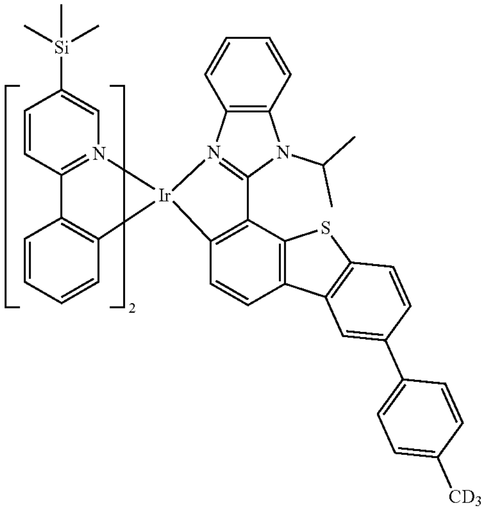
2413
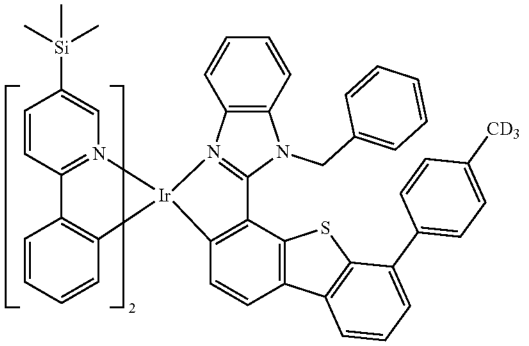
-continued
2414
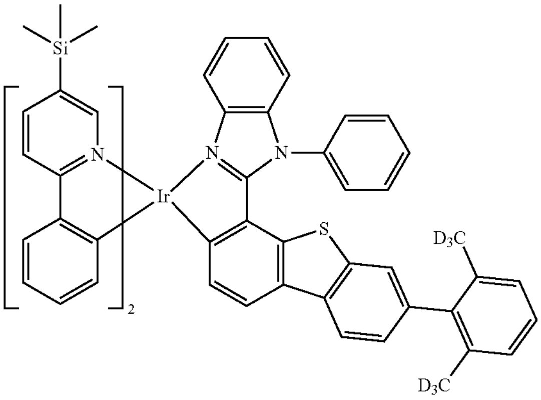
2415
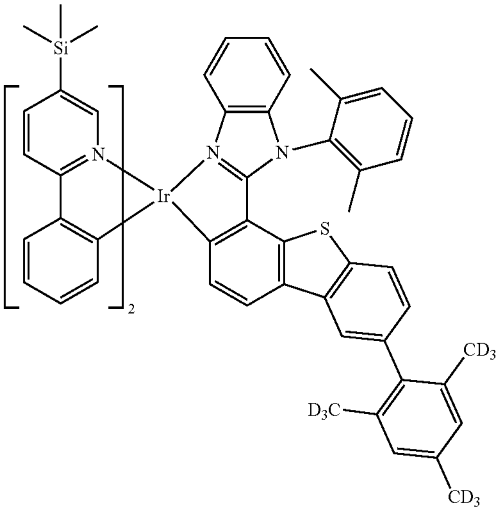
2416
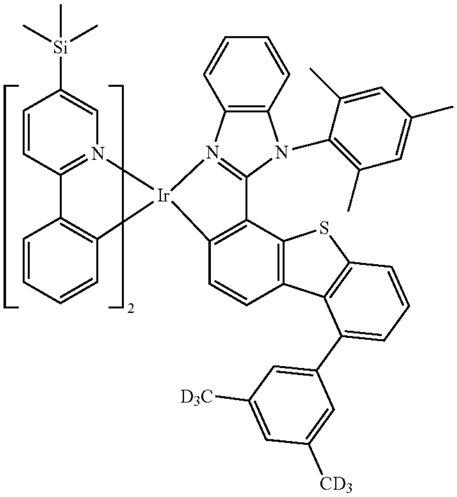

-continued
2417
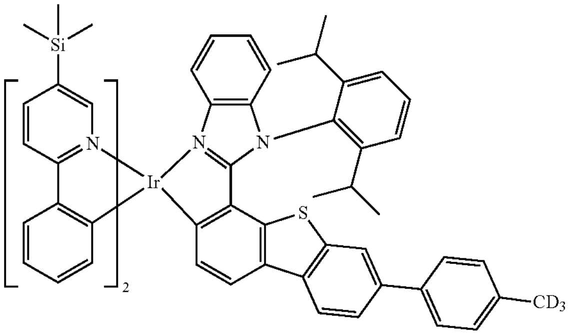
2418
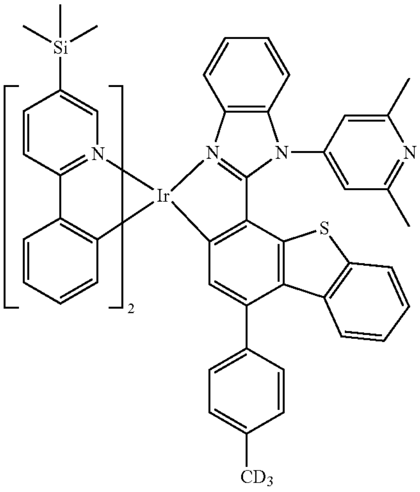
2419
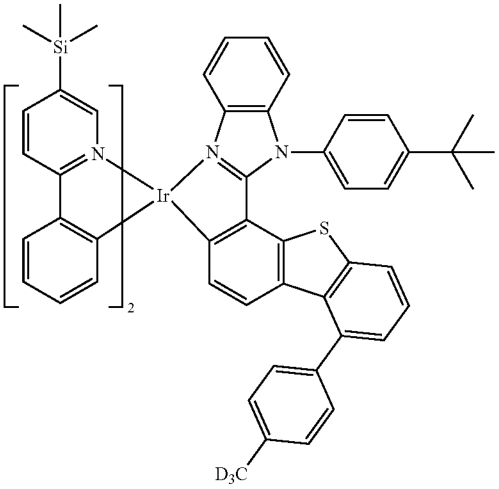
-continued
2420
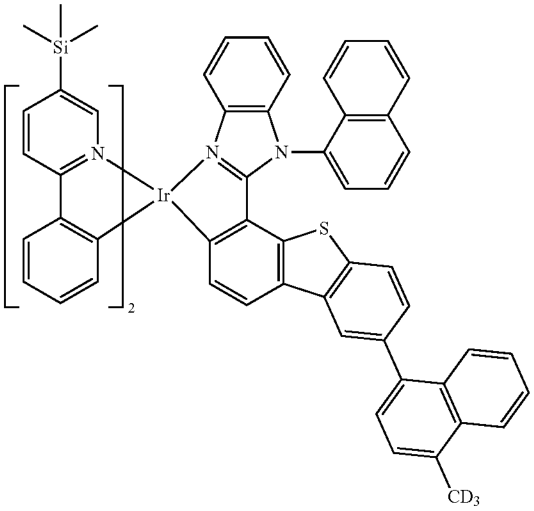
2421
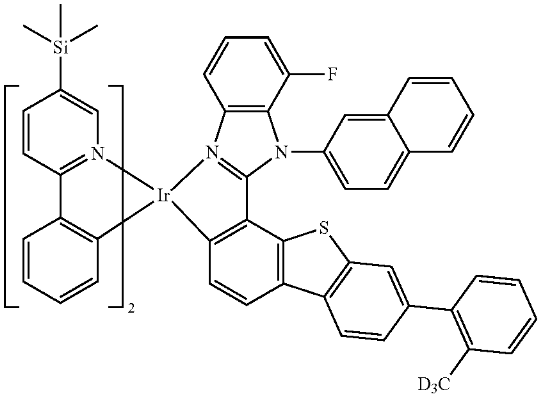
2422
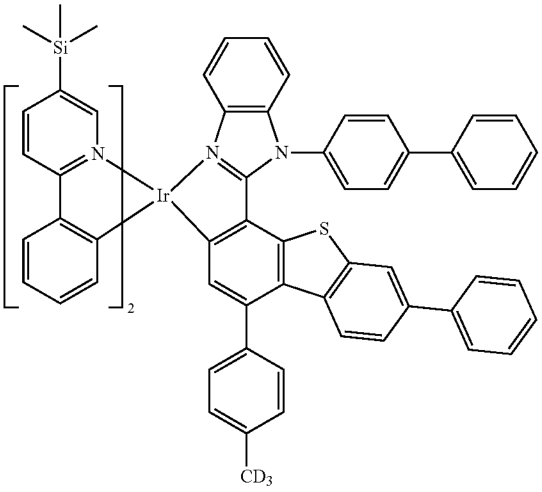

-continued
2423
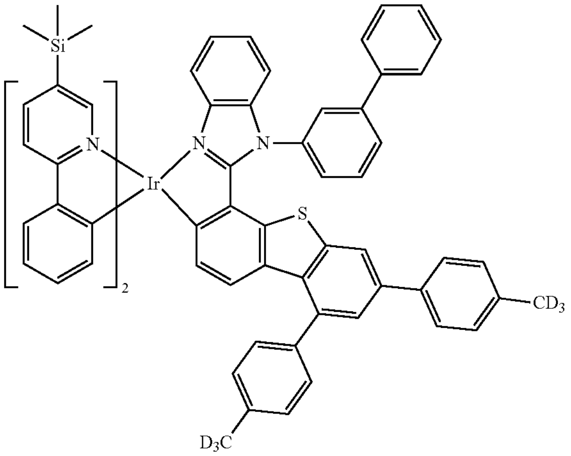
2424
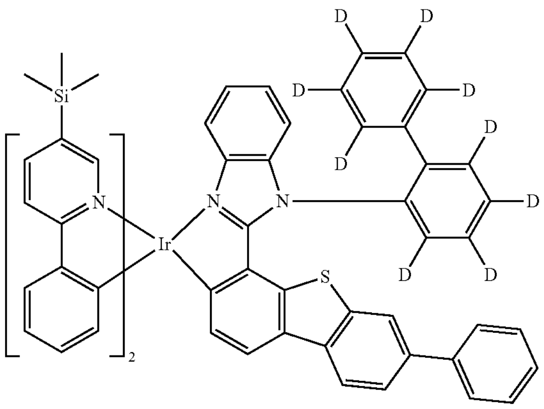
2425
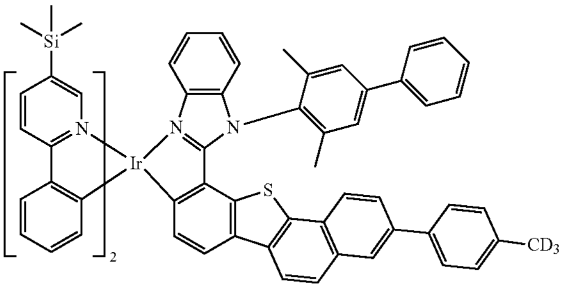
2426
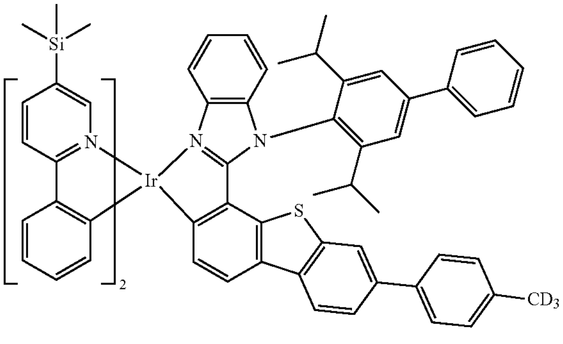
-continued
2427
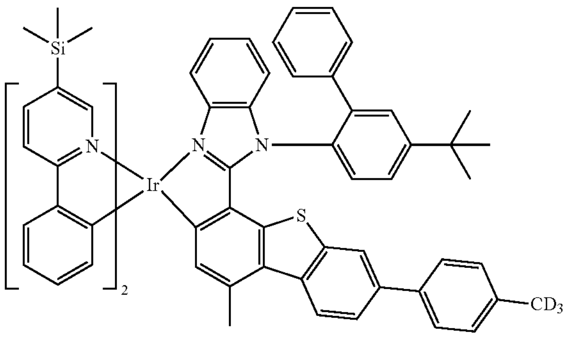
2428
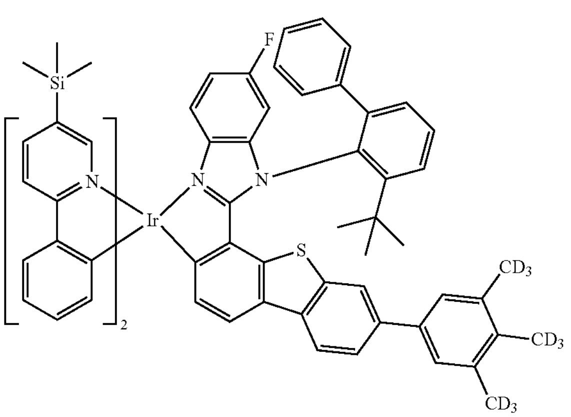
2429
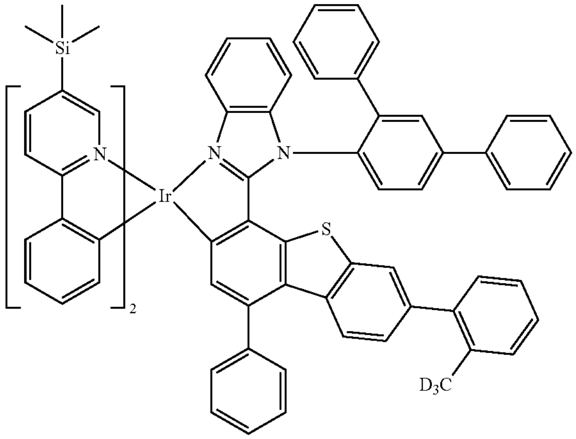

-continued
2430
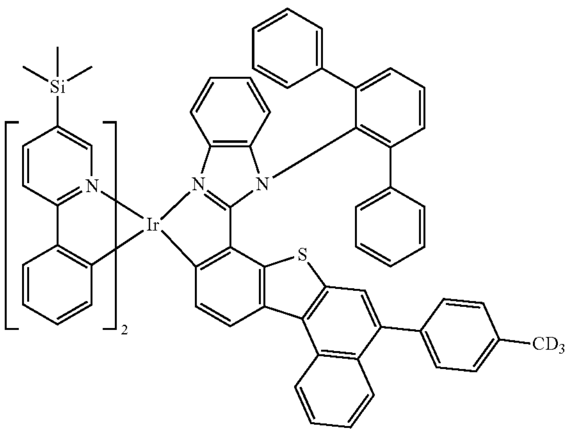
2431
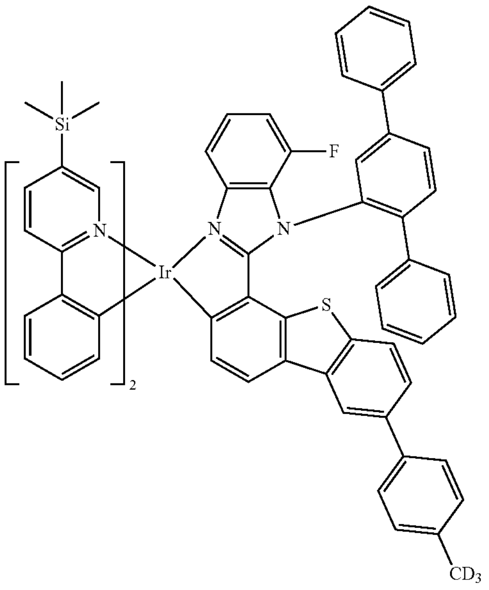
2432
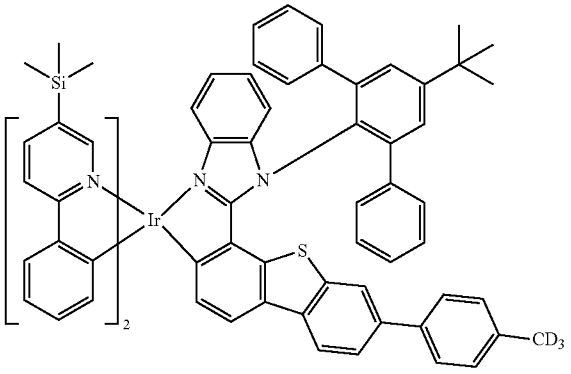
-continued
2433
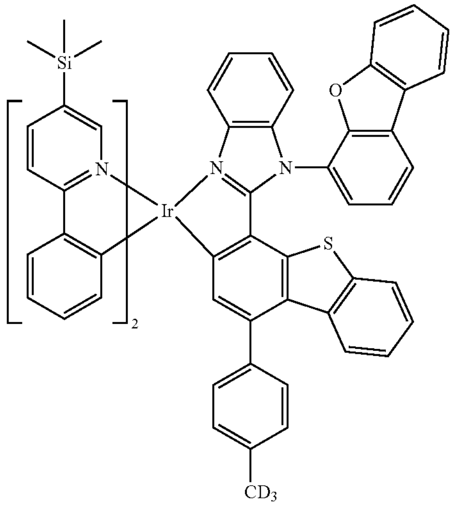
2434
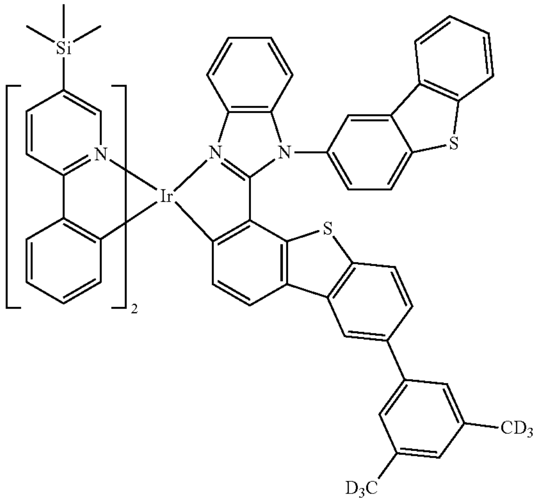
2435
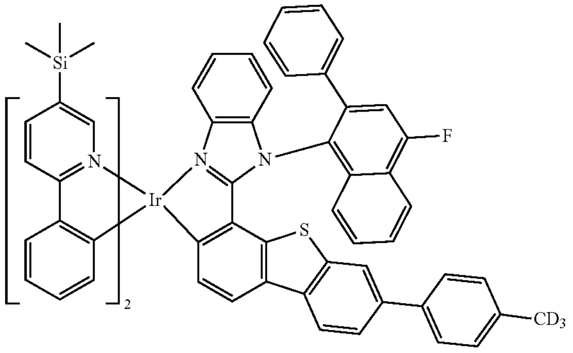

-continued
2436
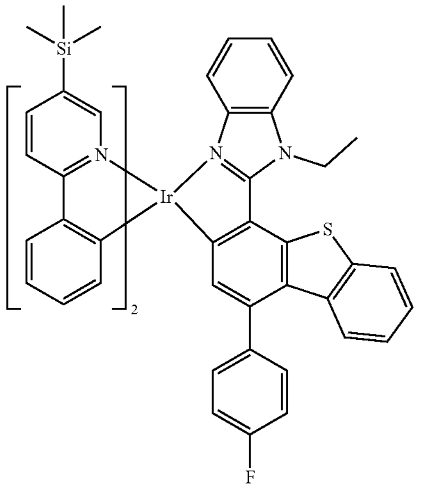
2437
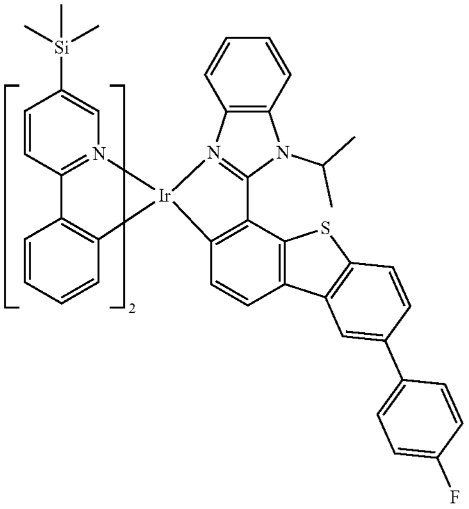
2438
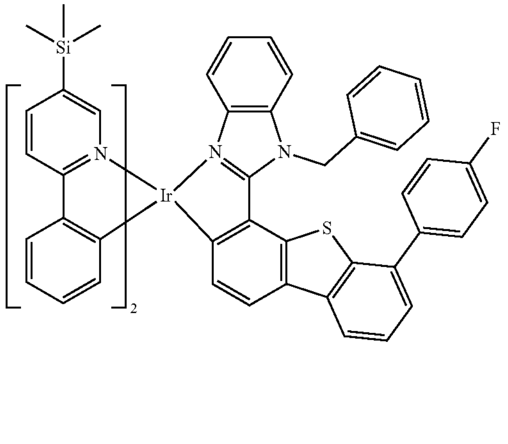
-continued
2439
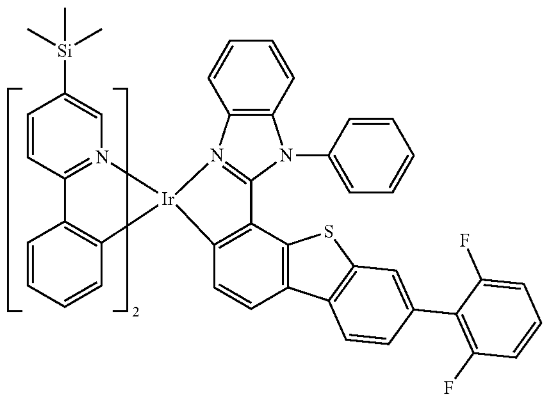
2440
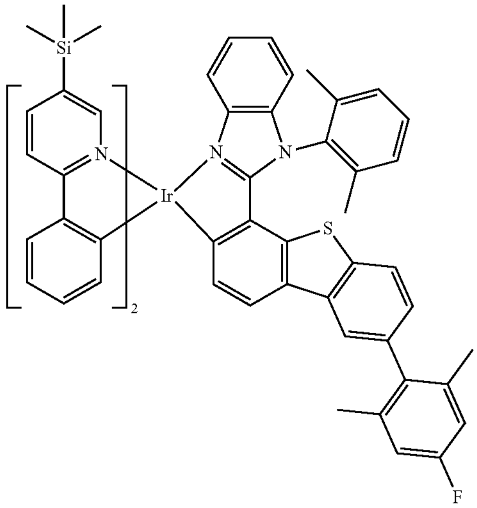
2441
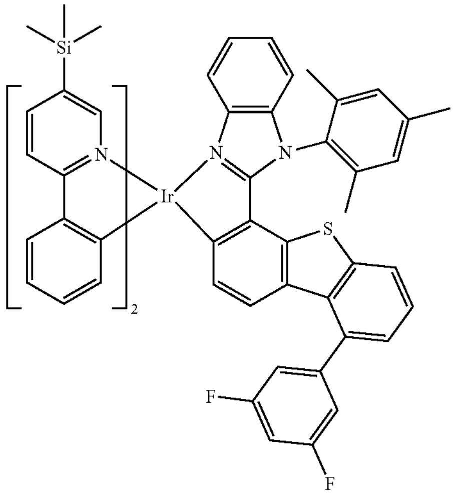

-continued
2442
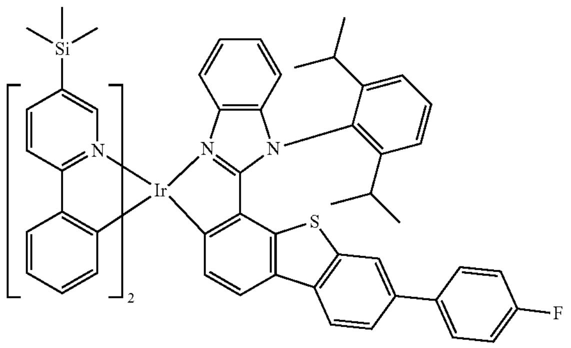
2443
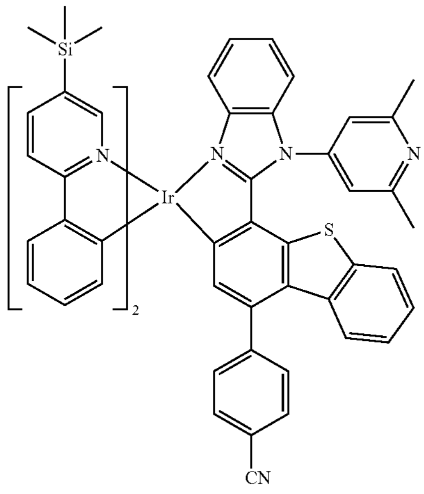
2444
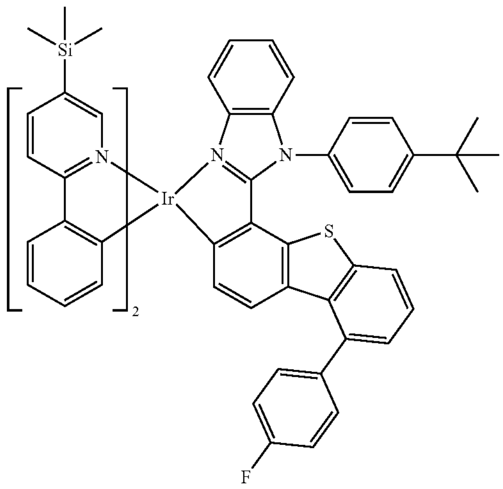
-continued
2445
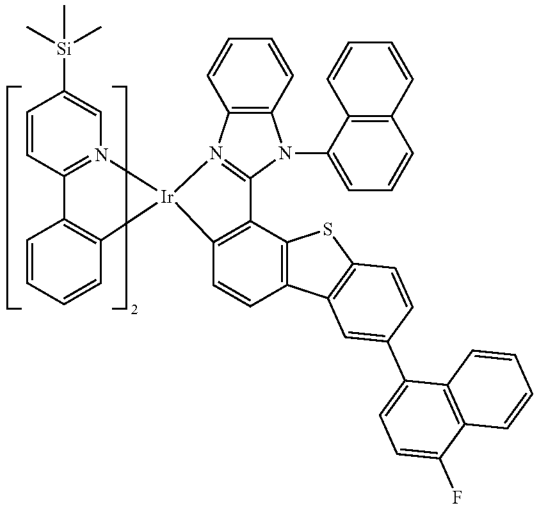
2446
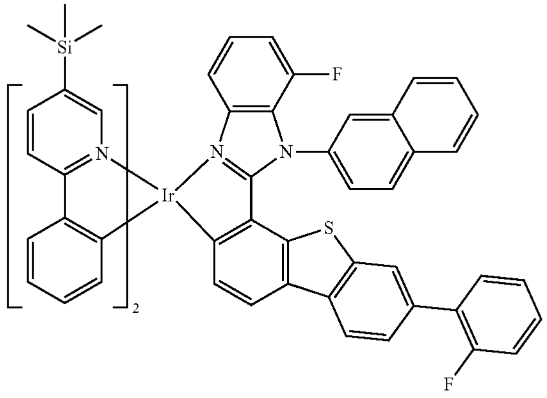
2447
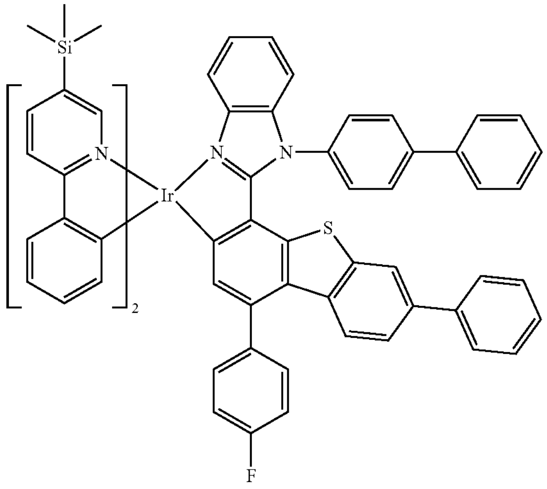

-continued
2448
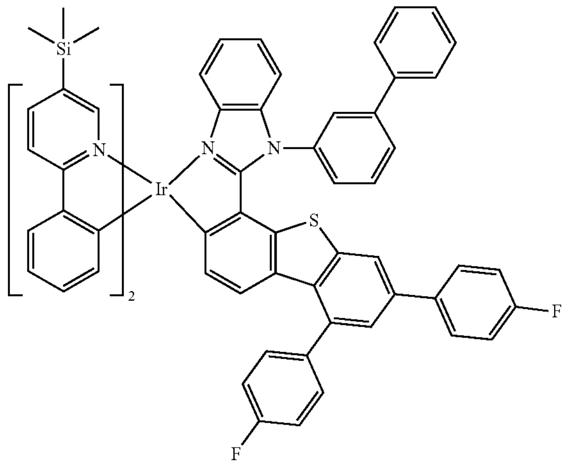
2449
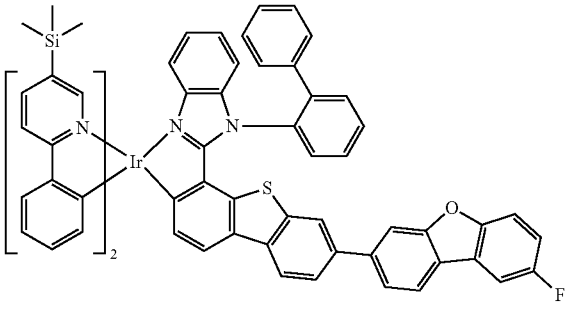
2450
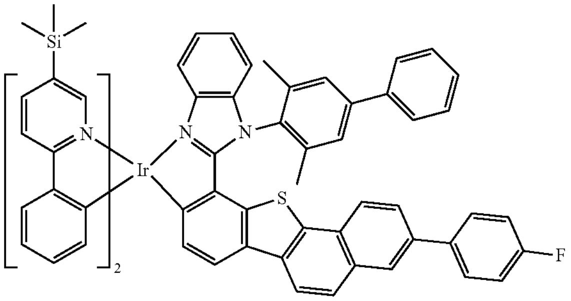
2451
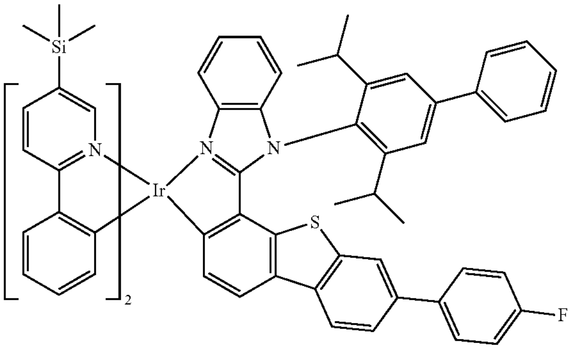
-continued
2452
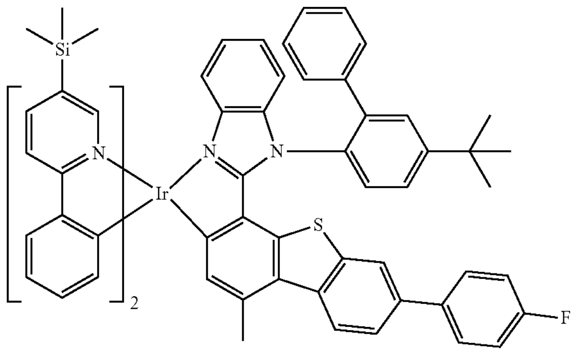
2453
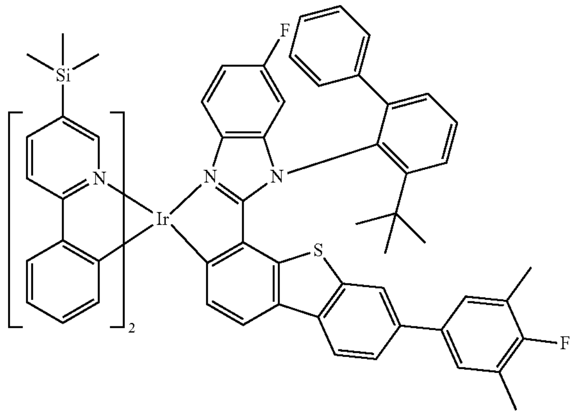
2454
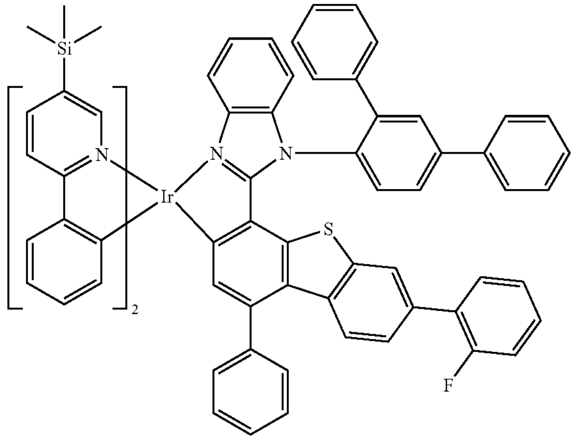

-continued
2455
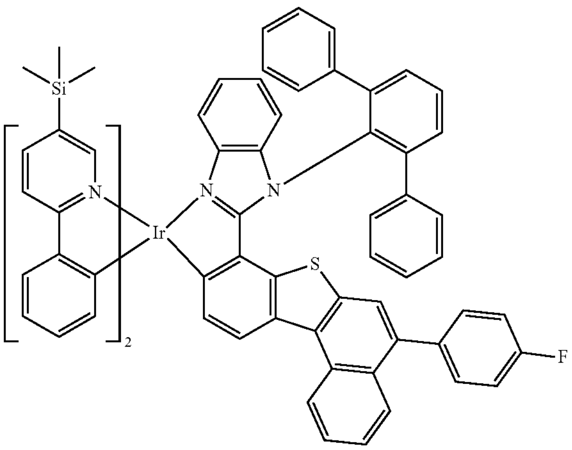
2456
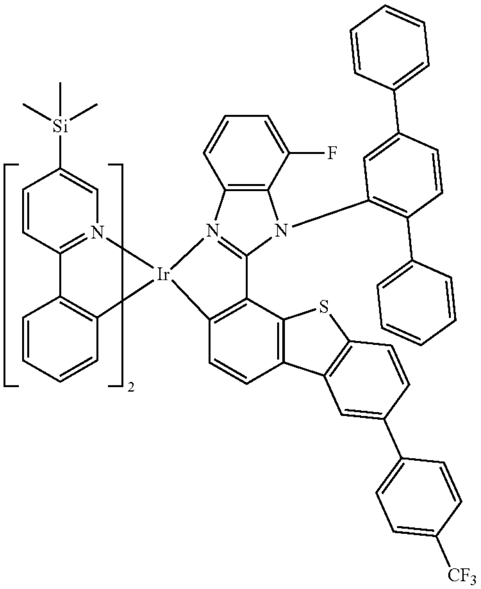
2457
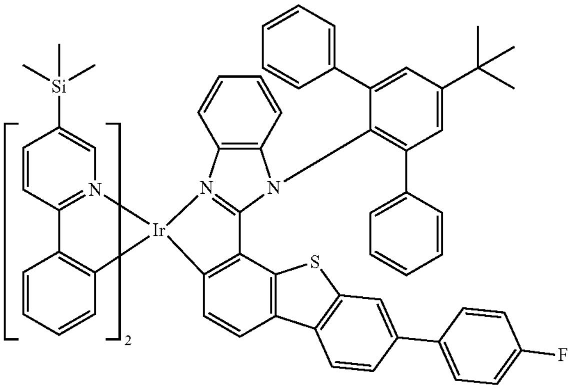
-continued
2458
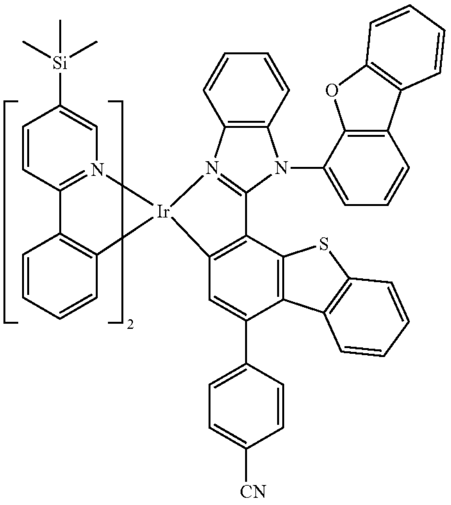
2459
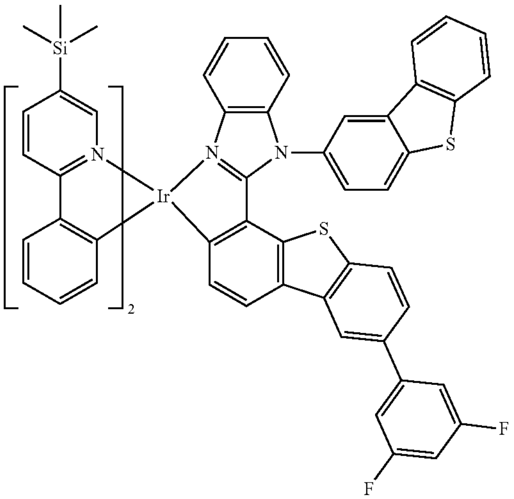
2460
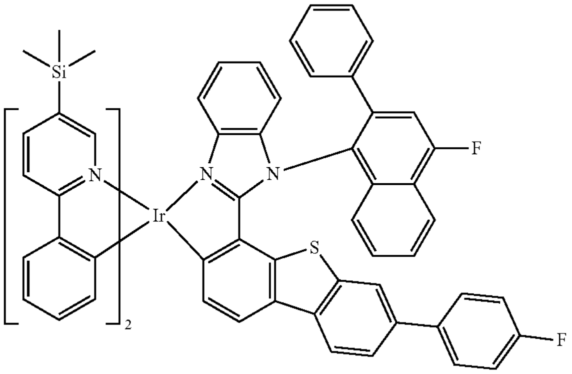

-continued
2461
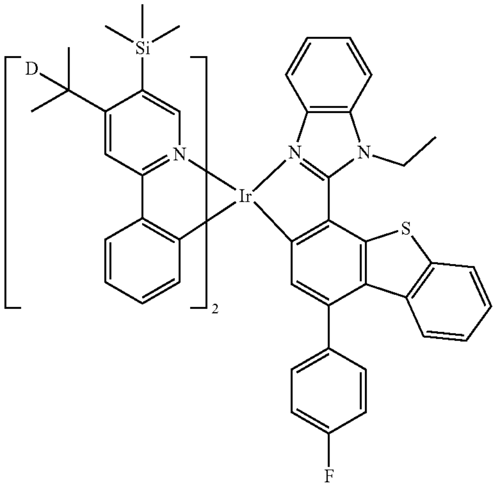
2462
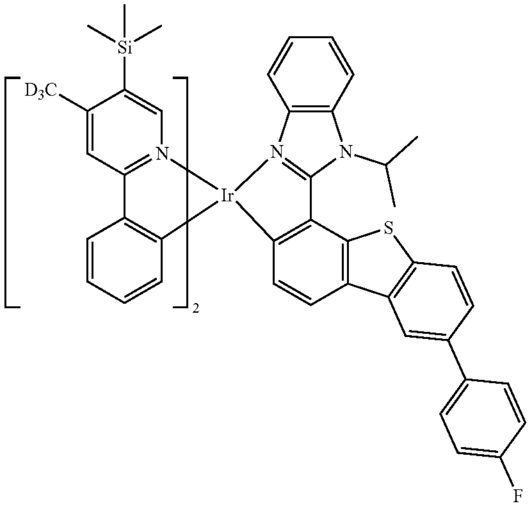
2463
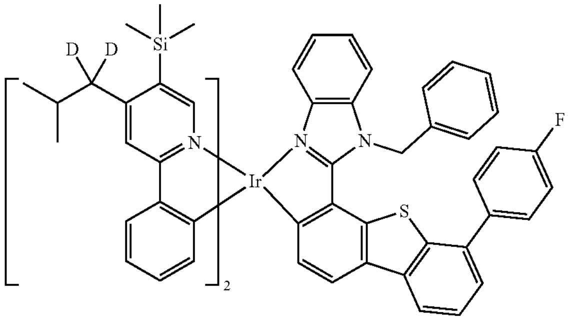
-continued
2464
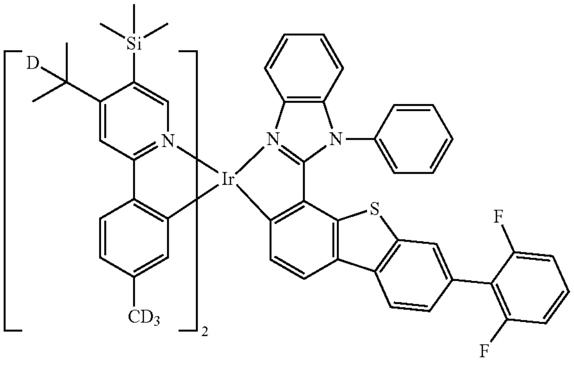
2465
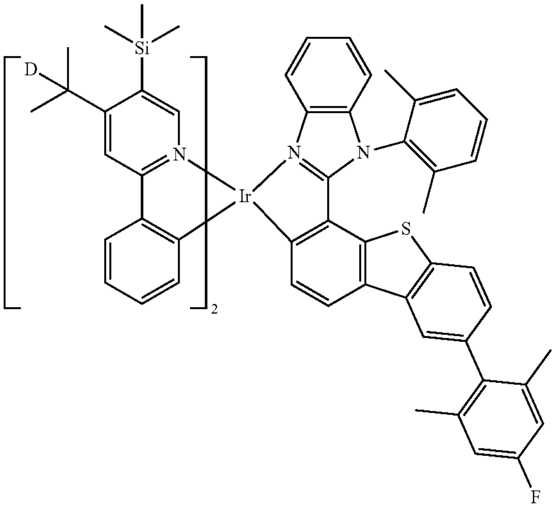
2466
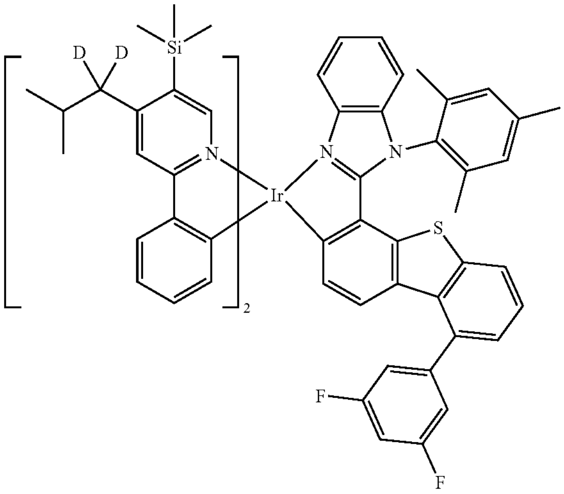

-continued
2467
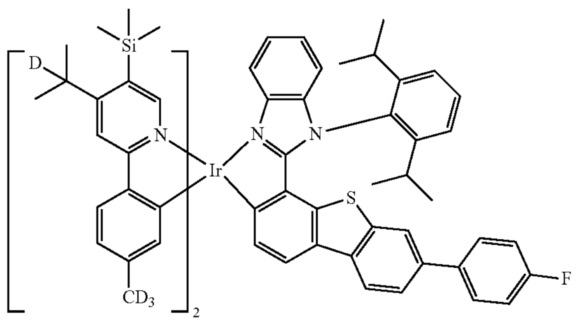
2468
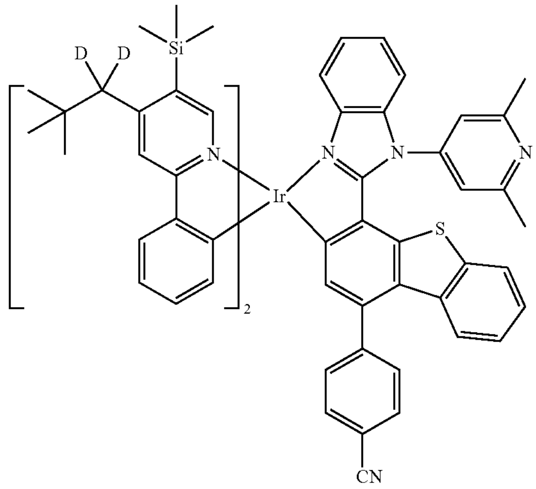
2469
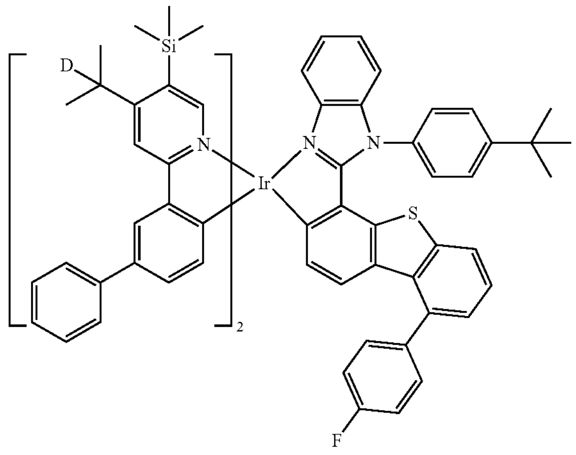
-continued
2470
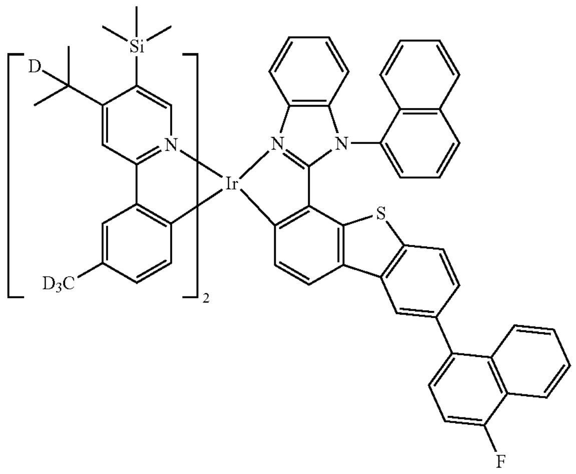
2471
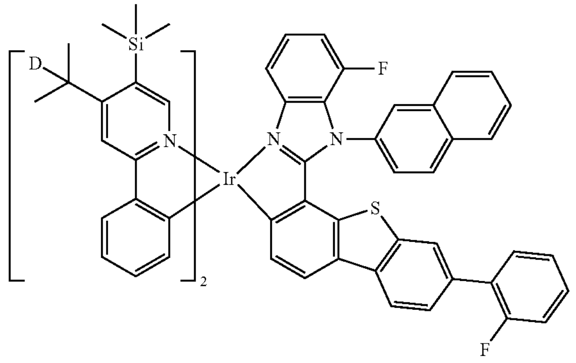
2472
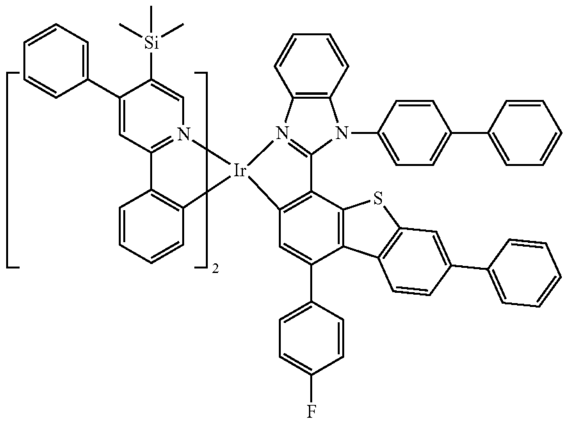

2473
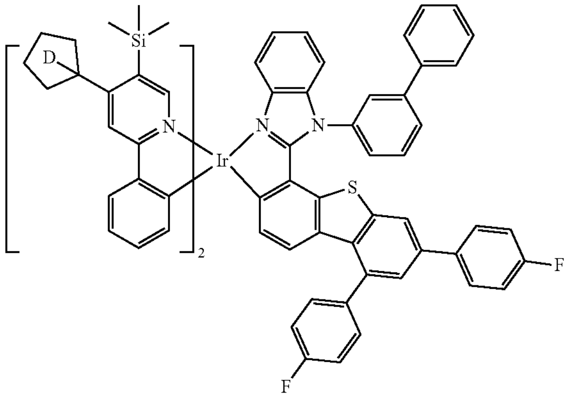
2474
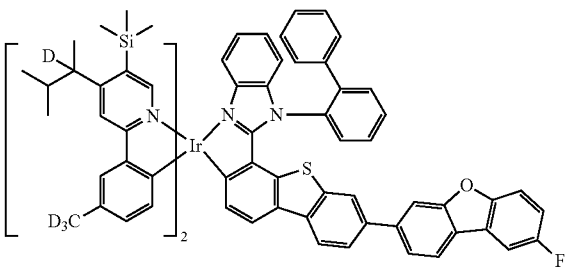
2475
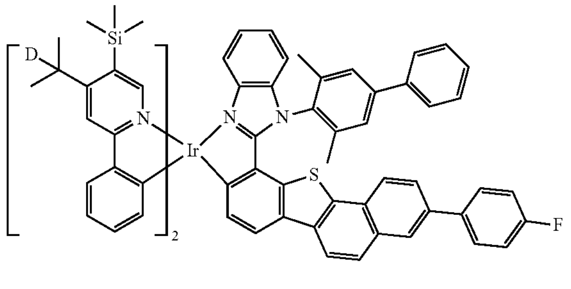
2476
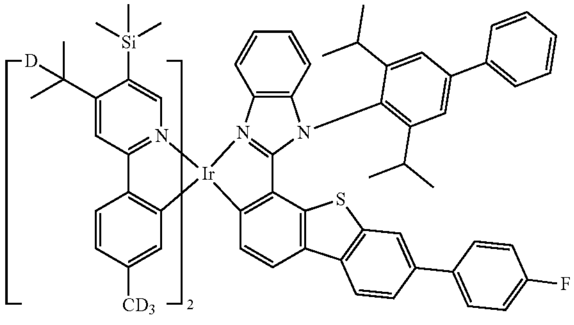
2477
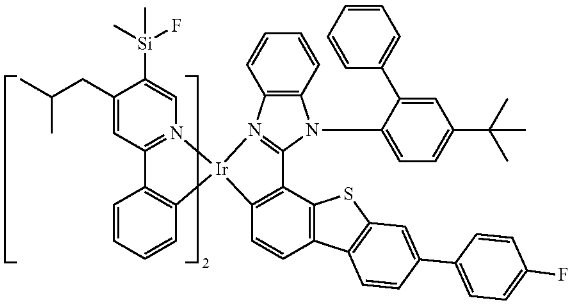
2478
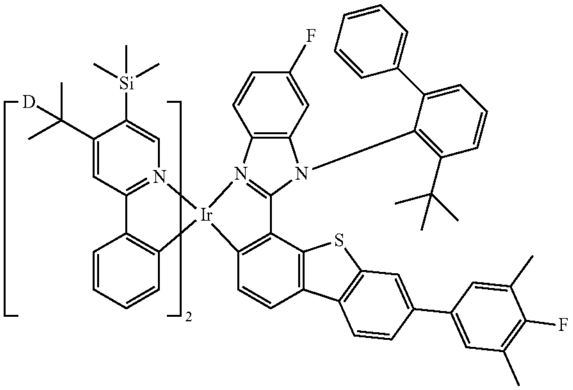
2479
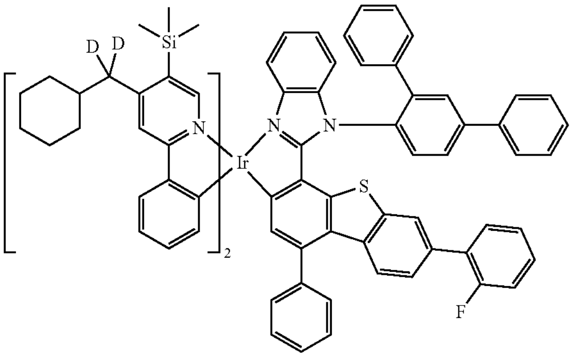
2480
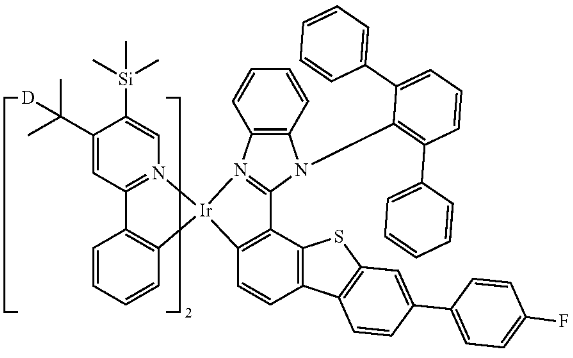

-continued
2481
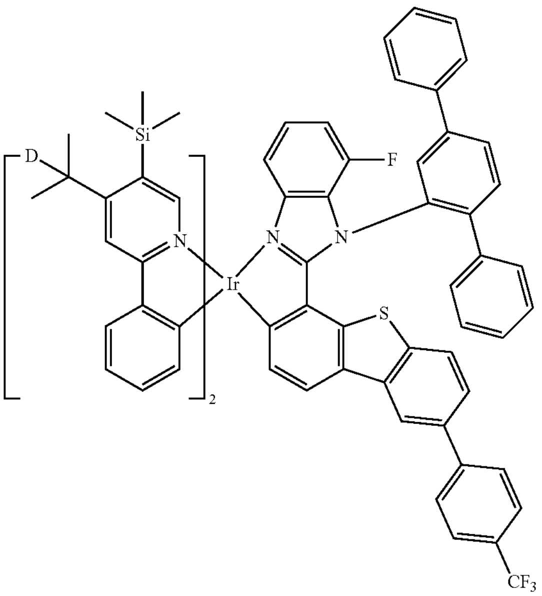
2482
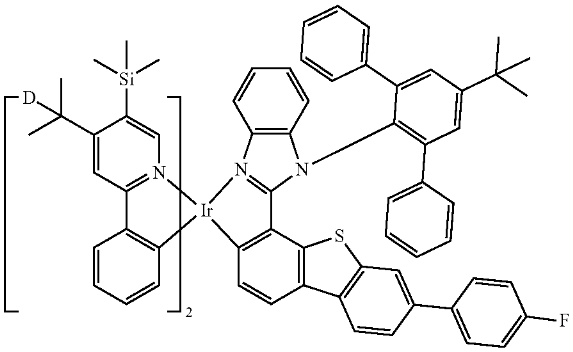
2483
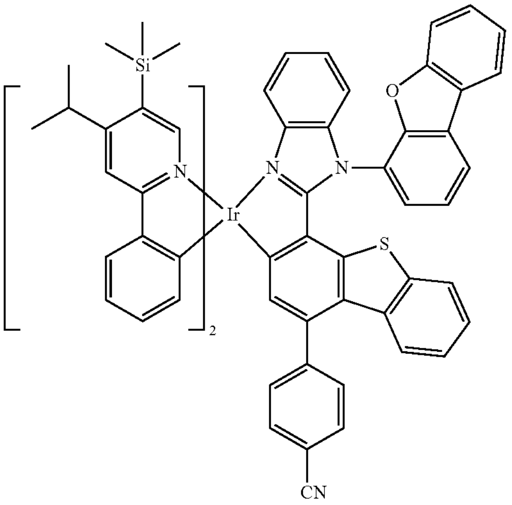
-continued
2484
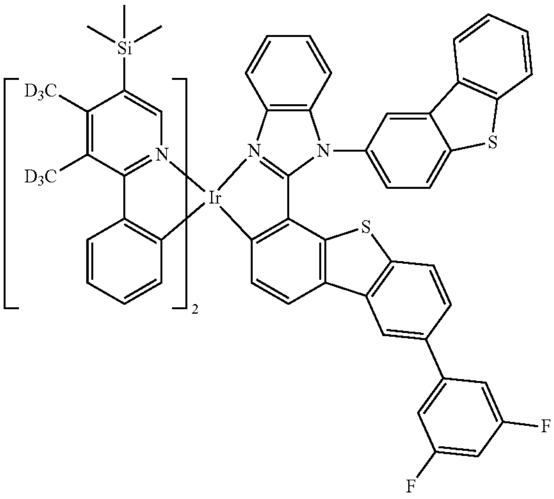
2485
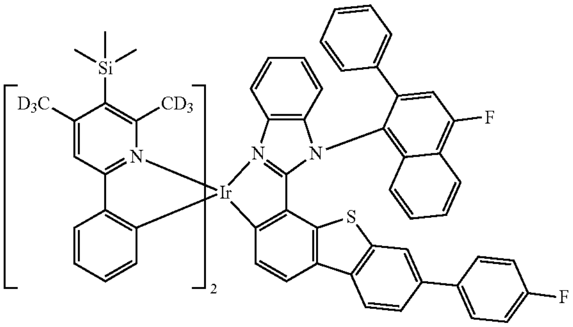
2486
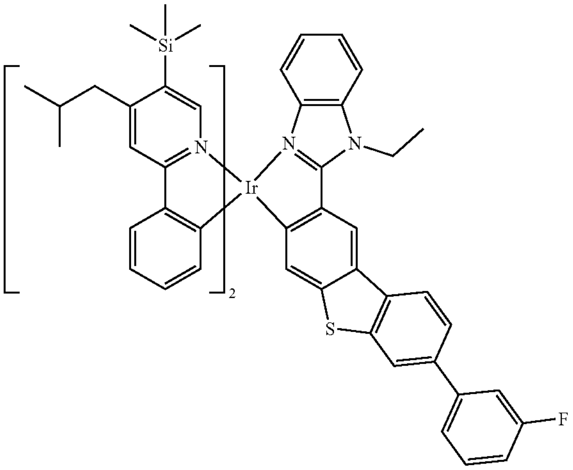

-continued
2487
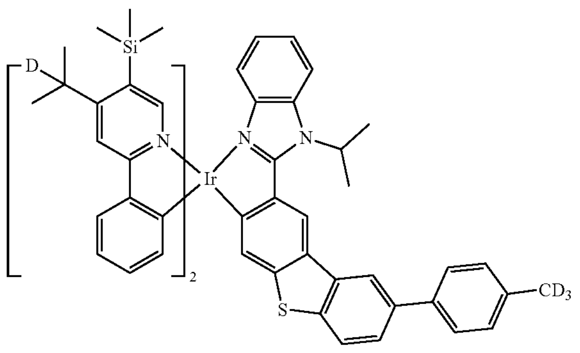
2488
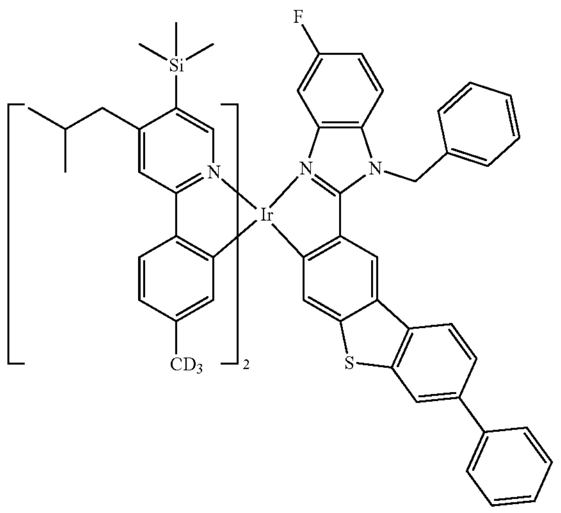
2489
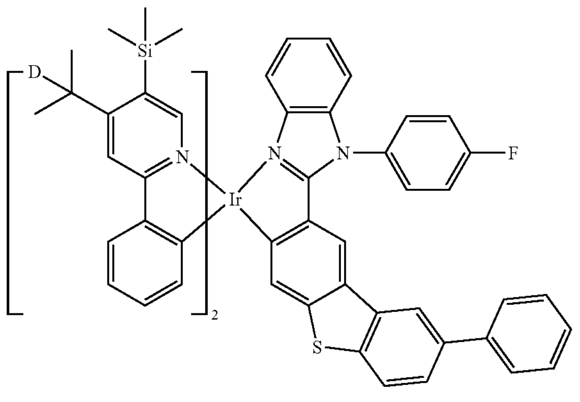
-continued
2490
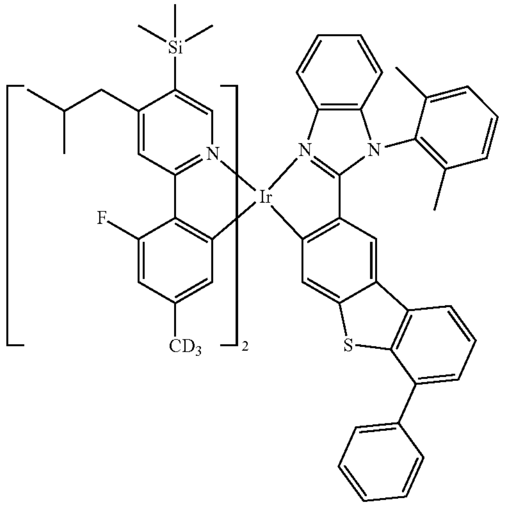
2491
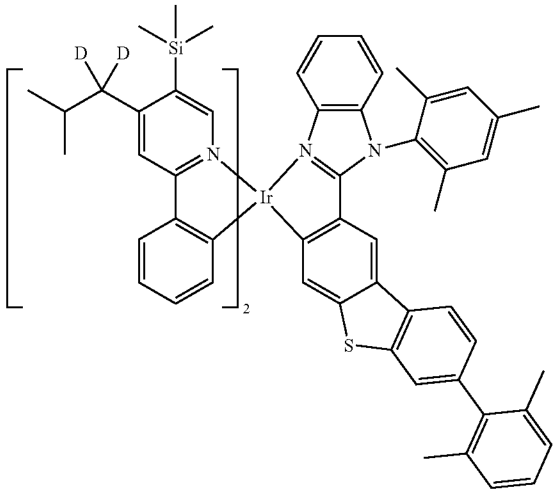
2492
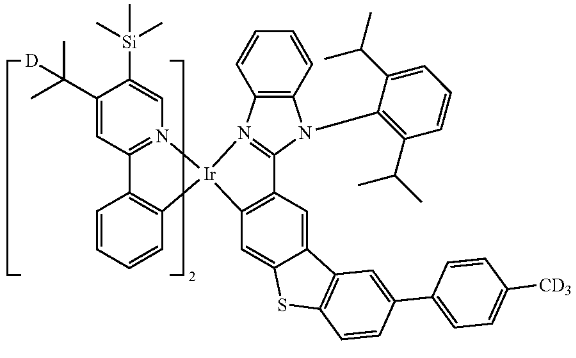

-continued
2493
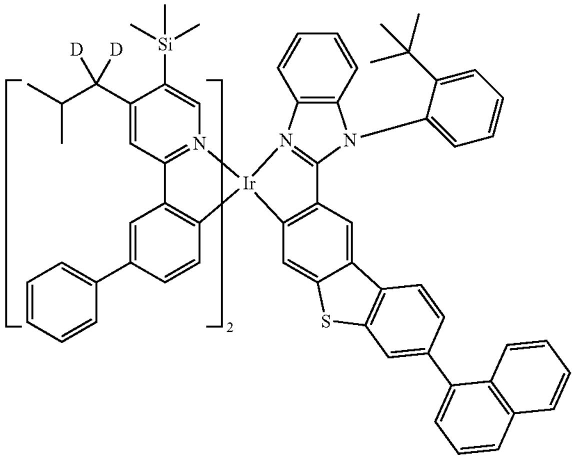
2494
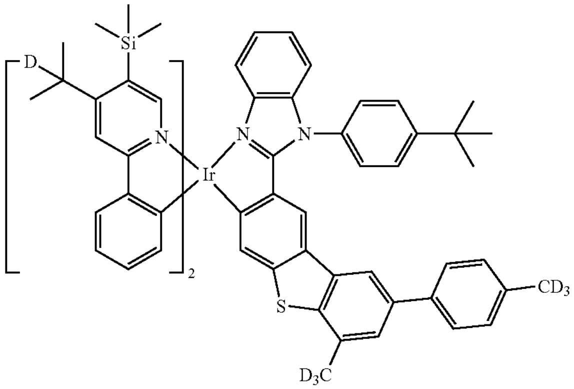
2495
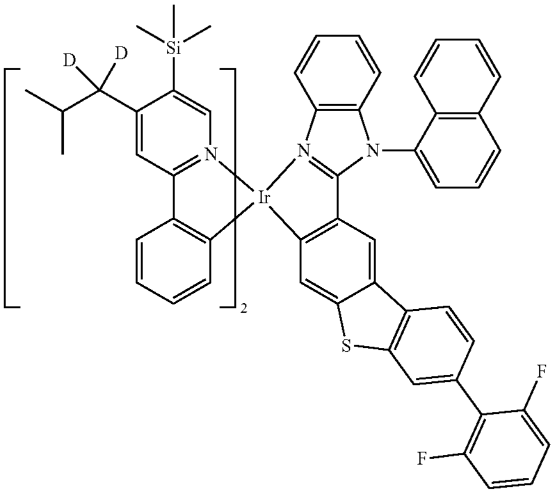
-continued
2496
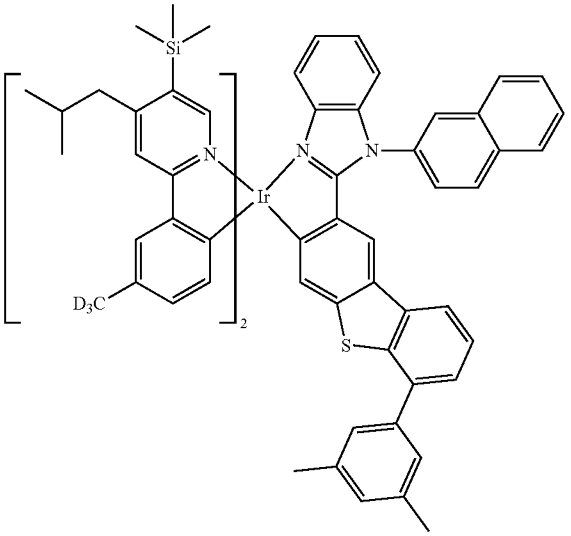
2497
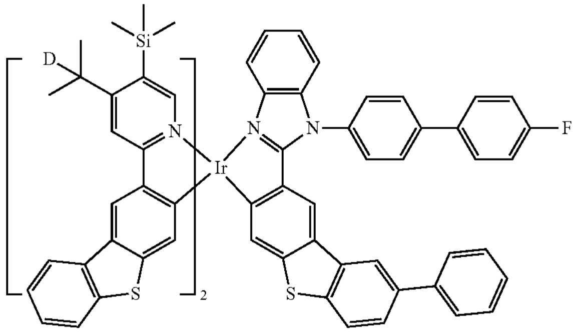
2498
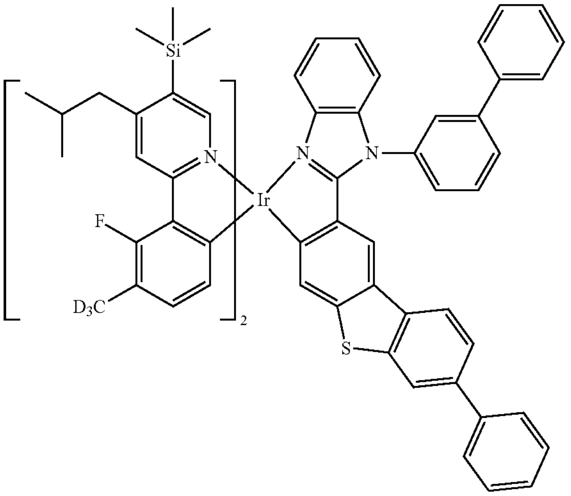

-continued
2499
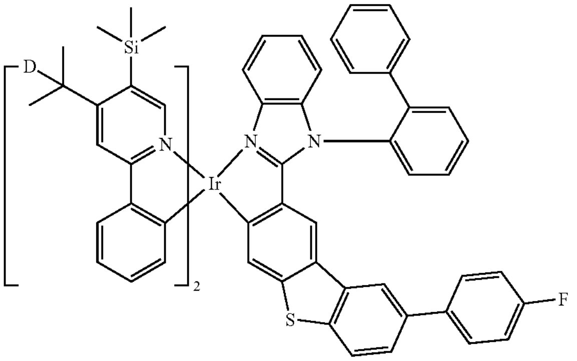
2500
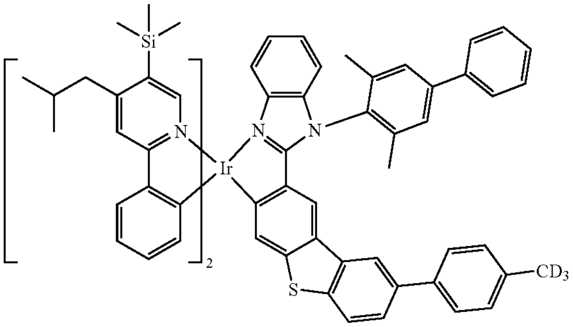
2501
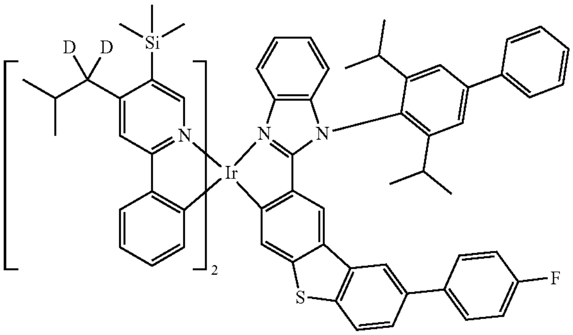
2502
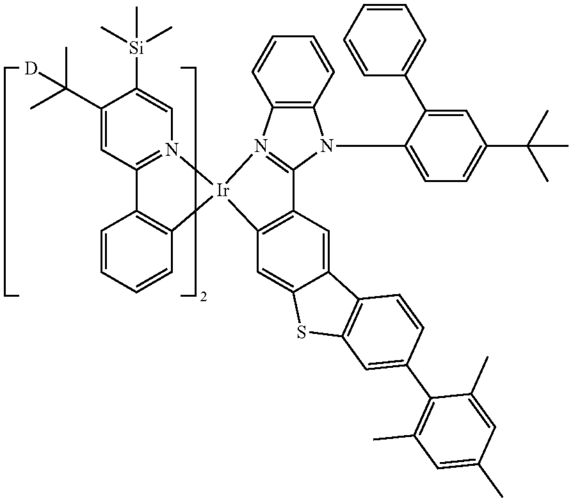
2503
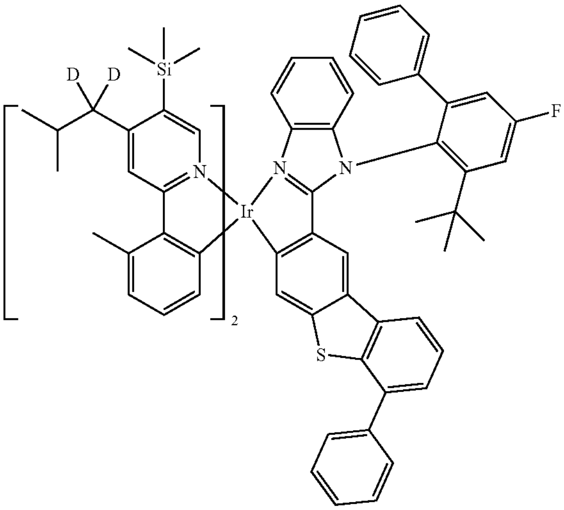
2504
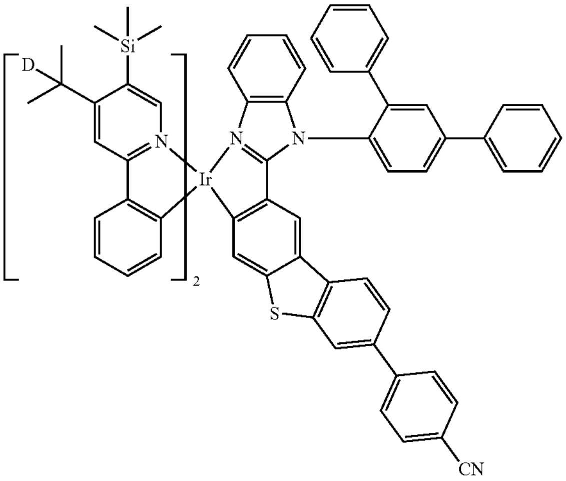
2505
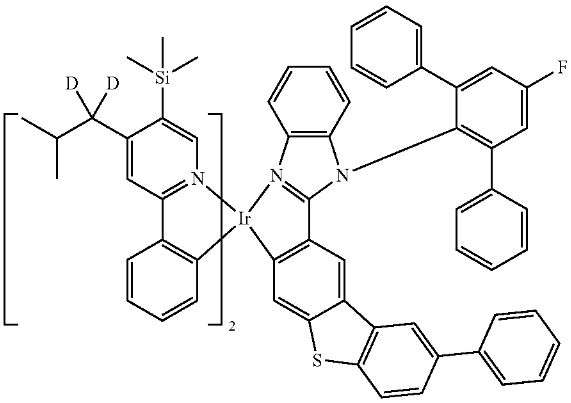

-continued
2506
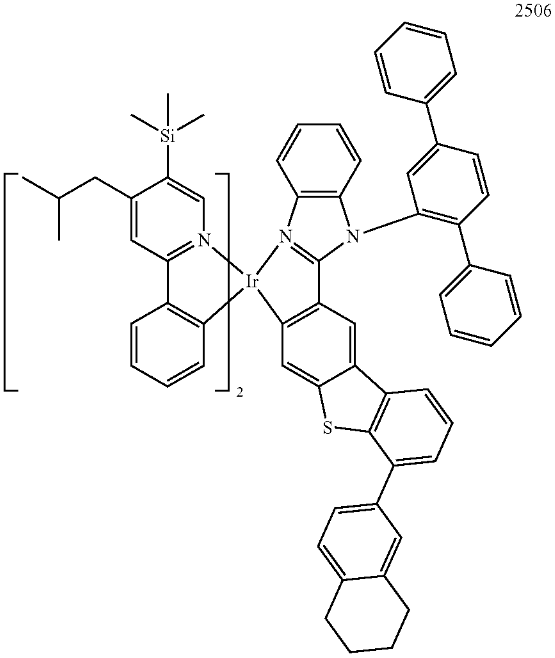
2507
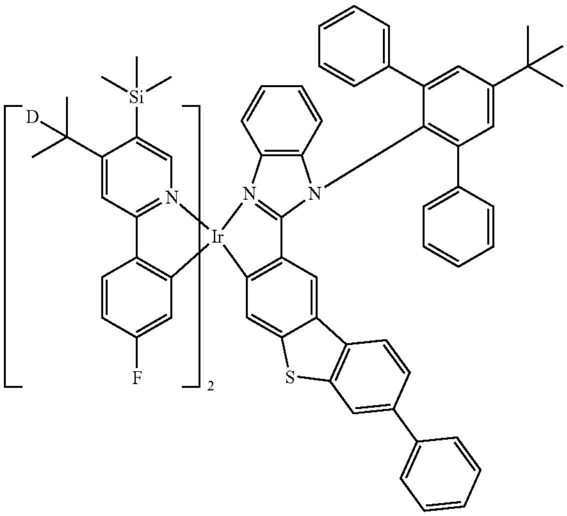
2508
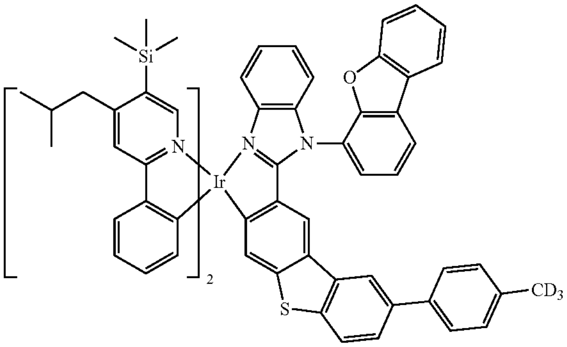
-continued
2509
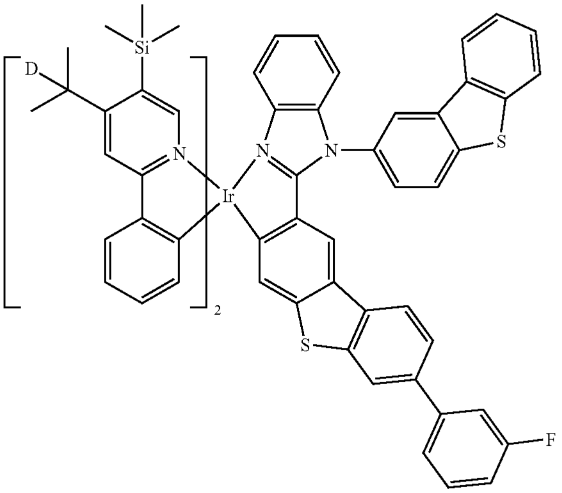
2510
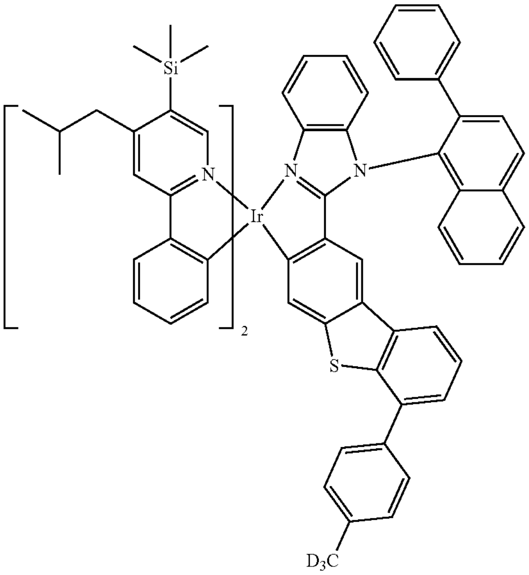
2511
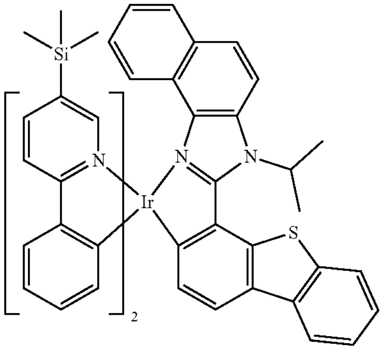

-continued
2512
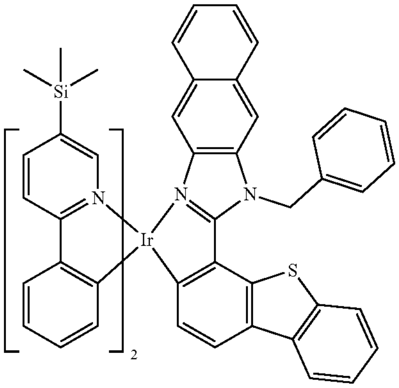
2513
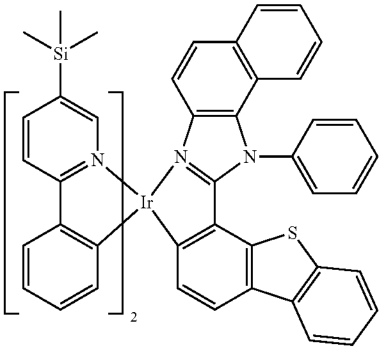
2514
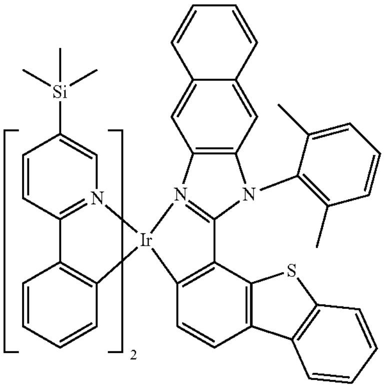
2515
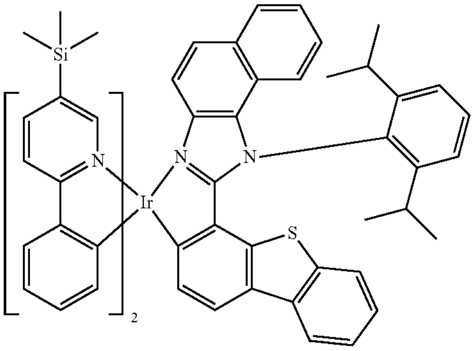
-continued
2516
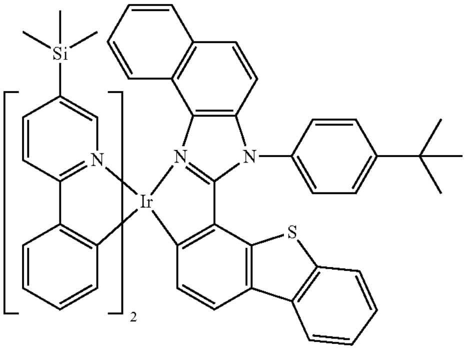
2517
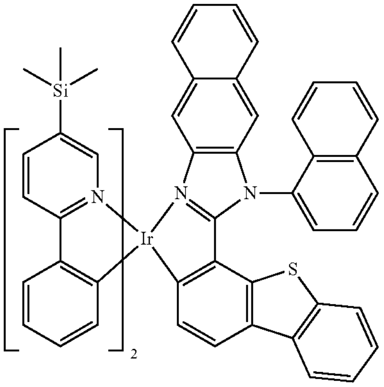
2518
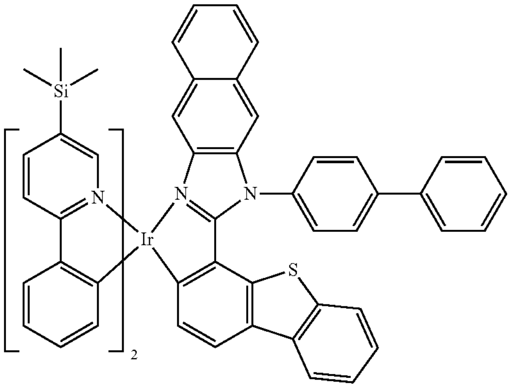
2519
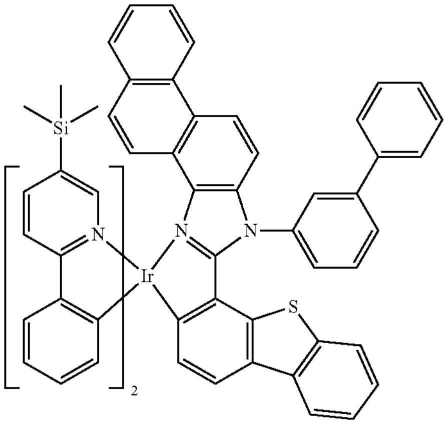

-continued
2520
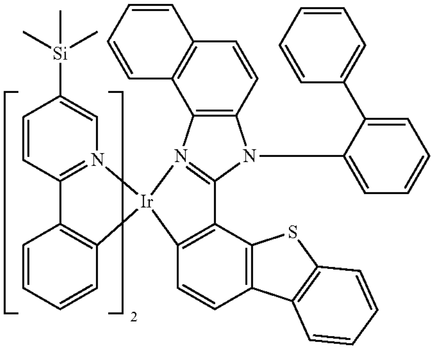
2521
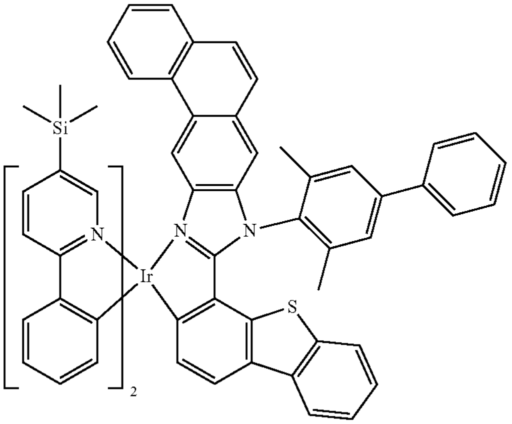
2522
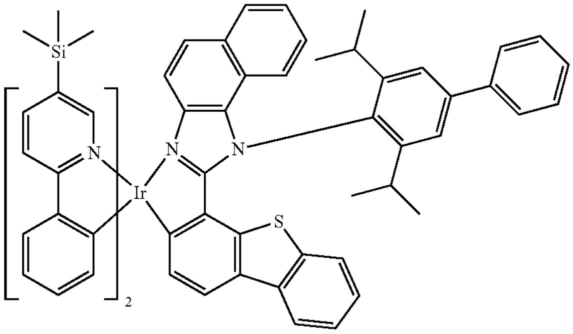
2523
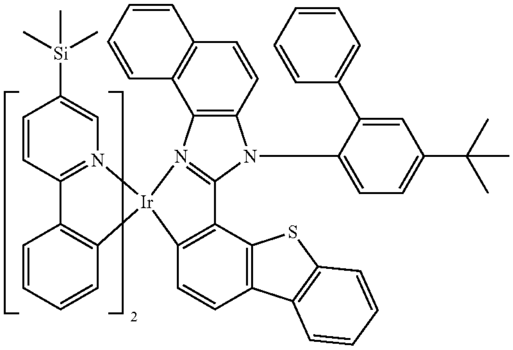
-continued
2524
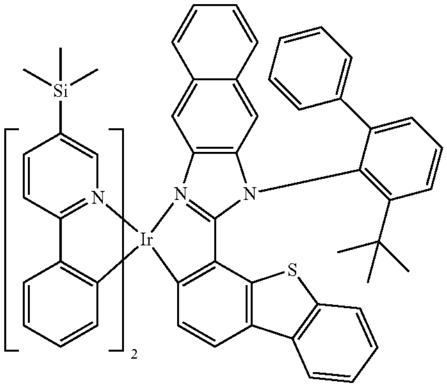
2525
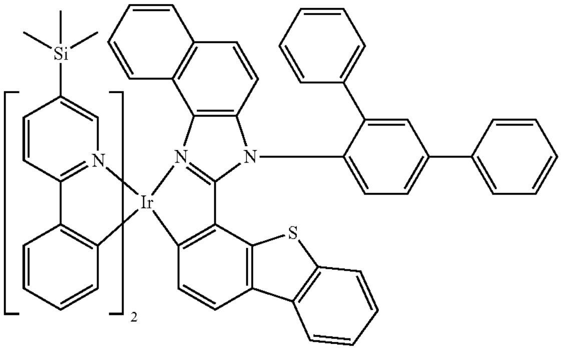
2526
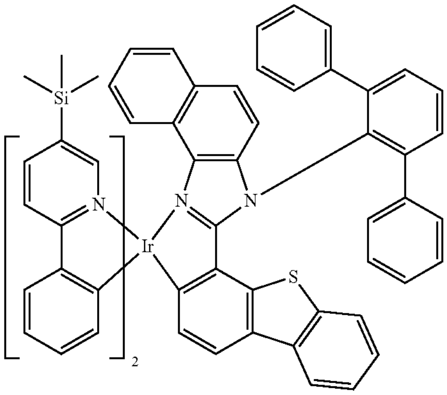
2527
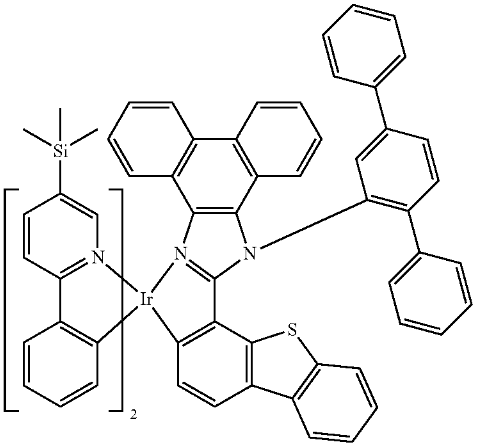

-continued
2528
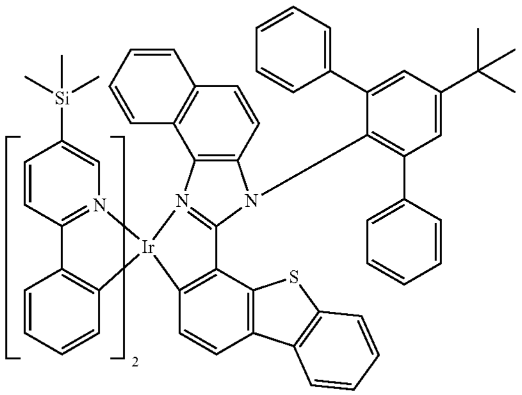
2529
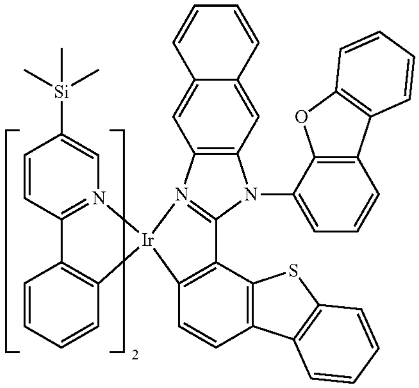
2530
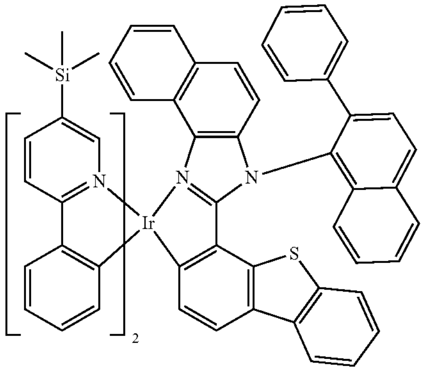
2531
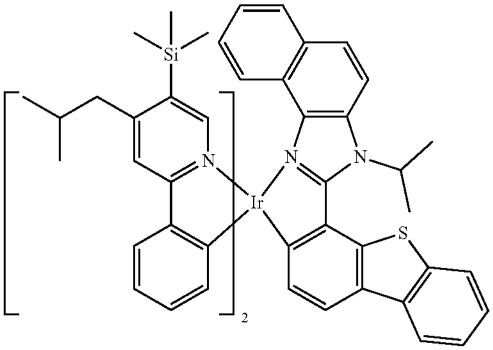
-continued
2532
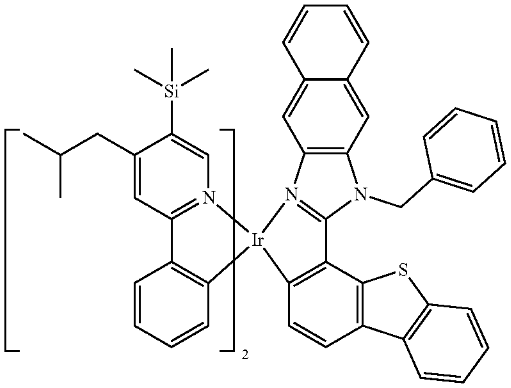
2533
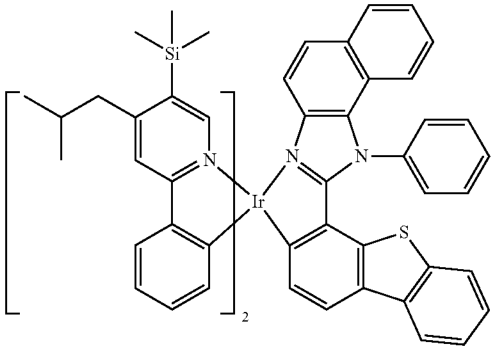
2534
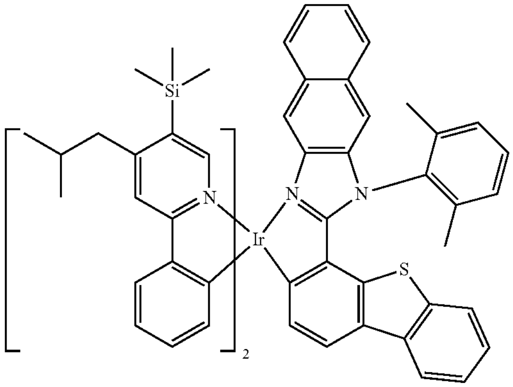
2535
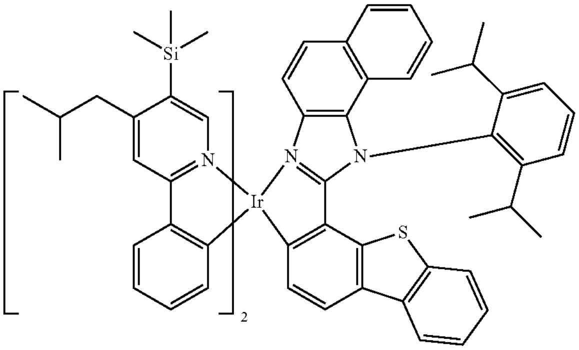

-continued
2536
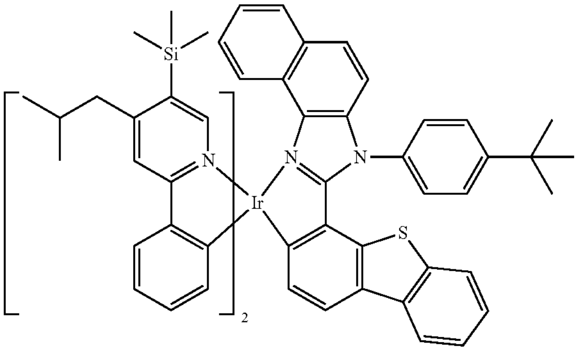
2537
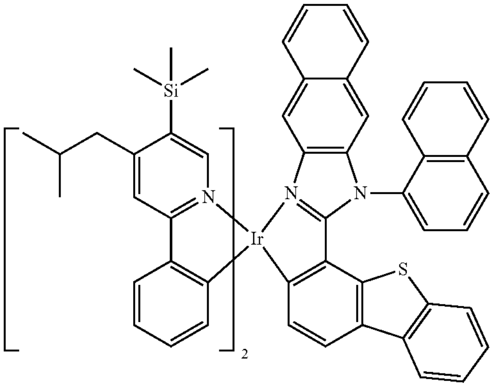
2538
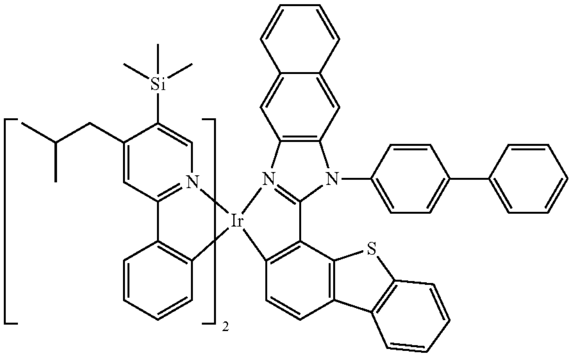
2539
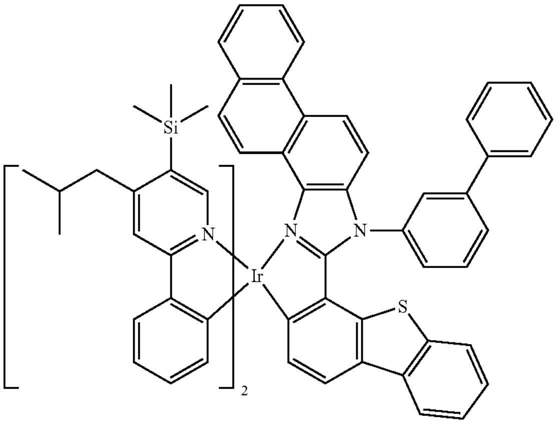
-continued
2540
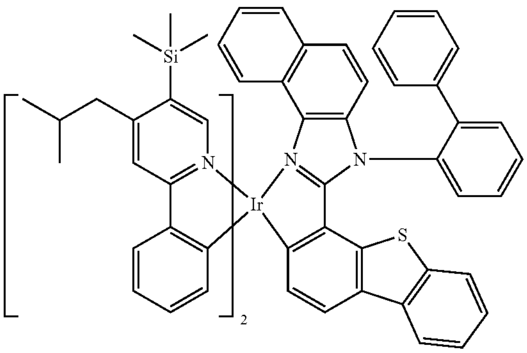
2541
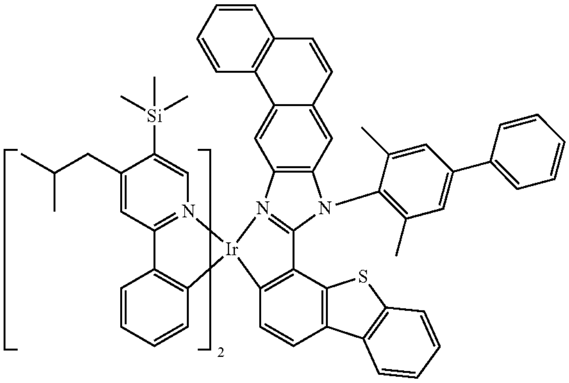
2542
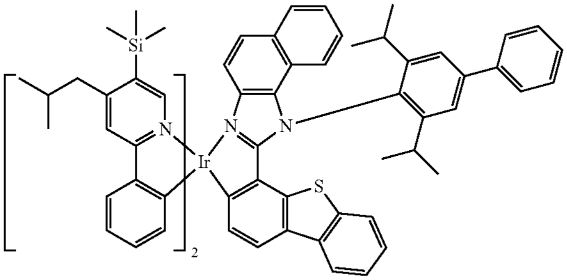
2543
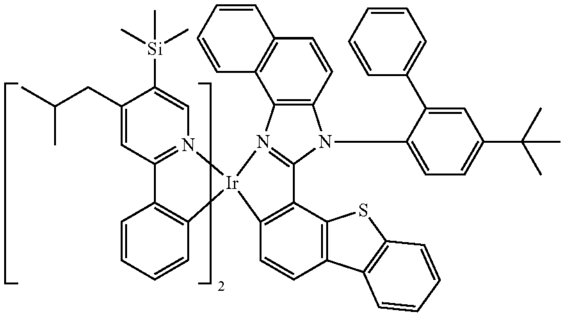

-continued
2544
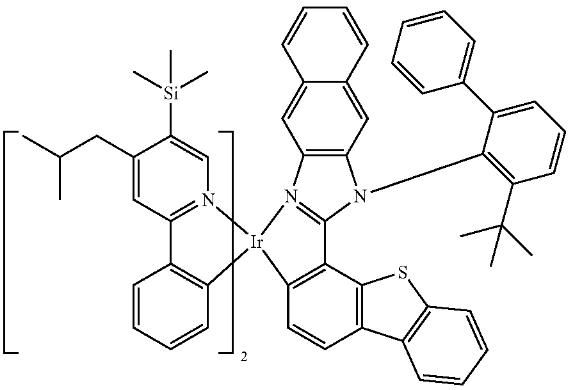
2545
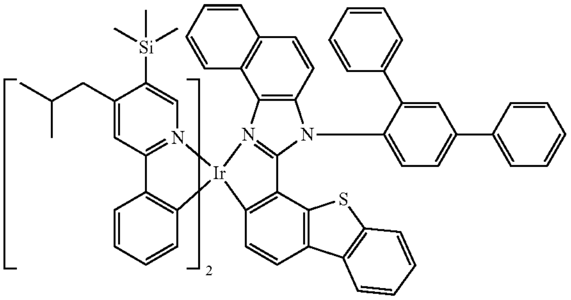
2546
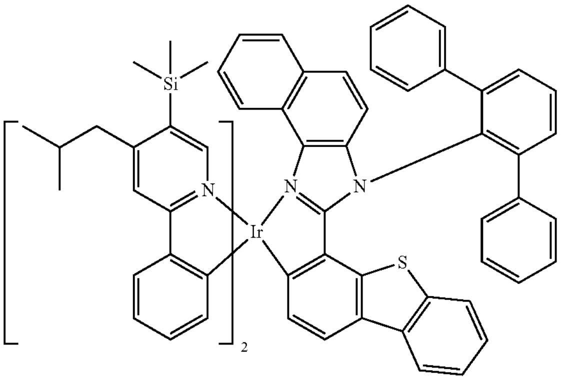
2547
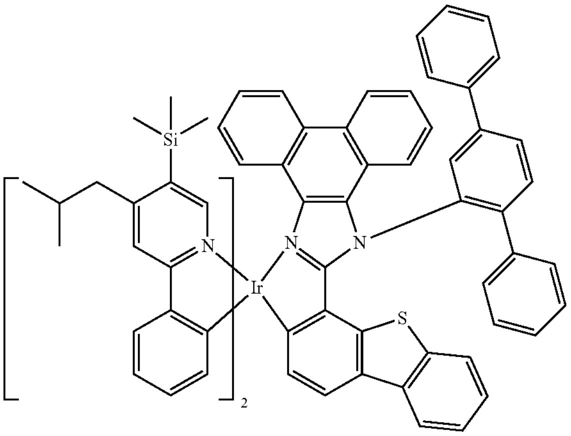
-continued
2548
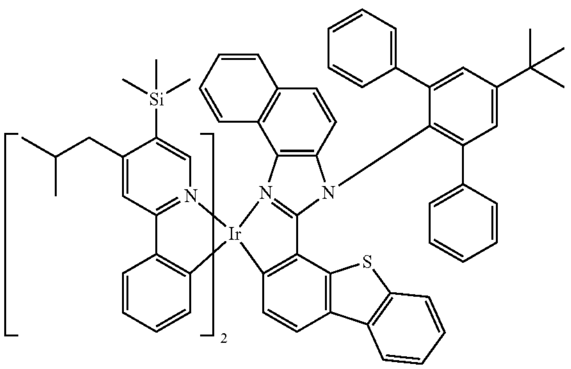
2549
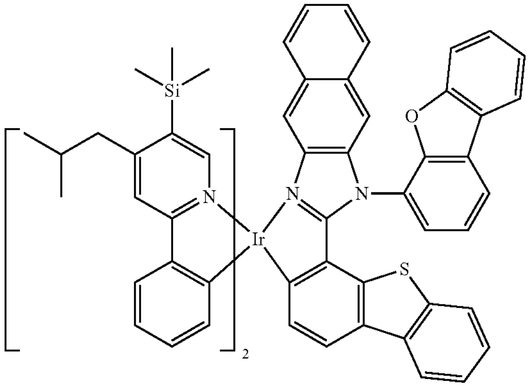
2550
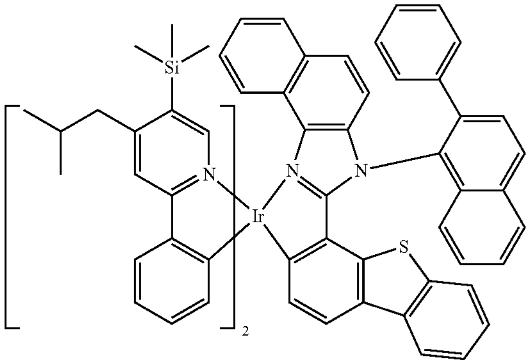
2551
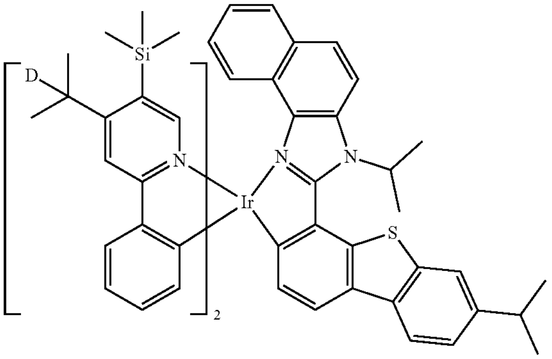

-continued
2552
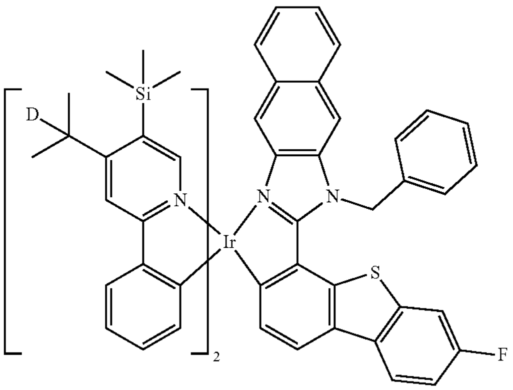
2553
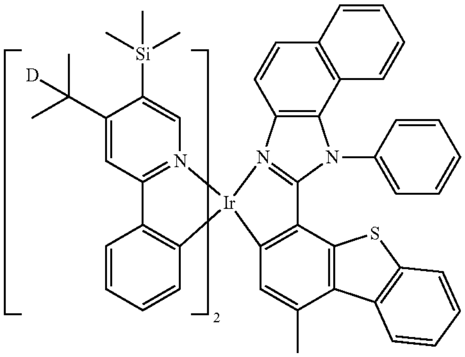
2554
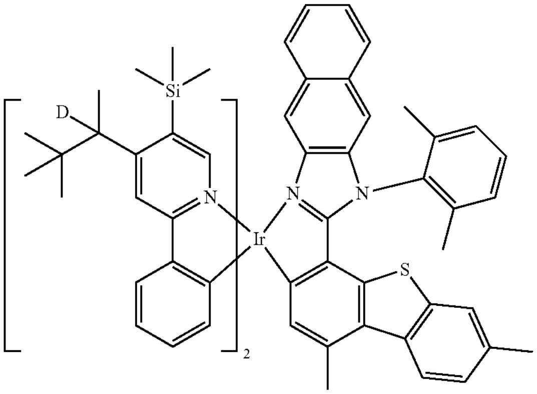
2555
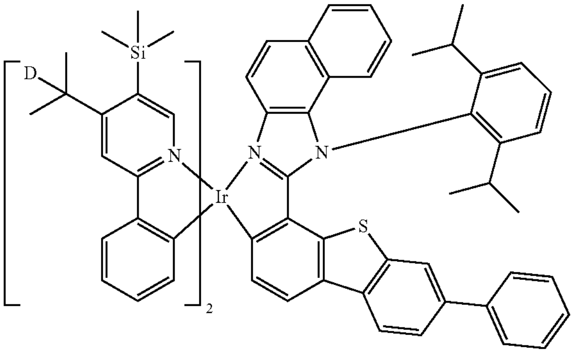
-continued
2556
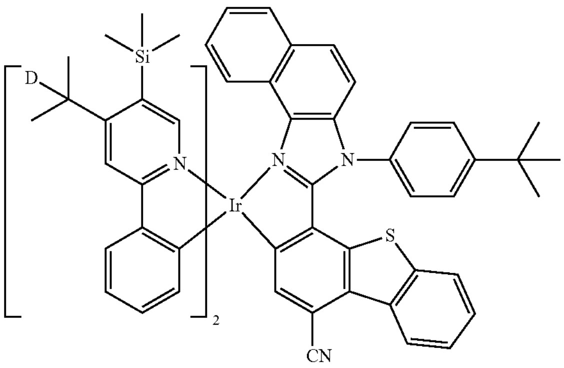
2557
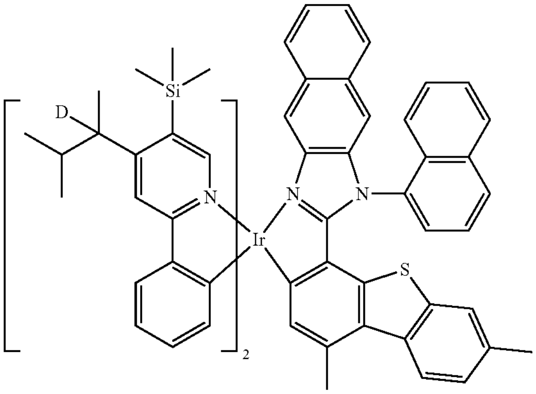
2558
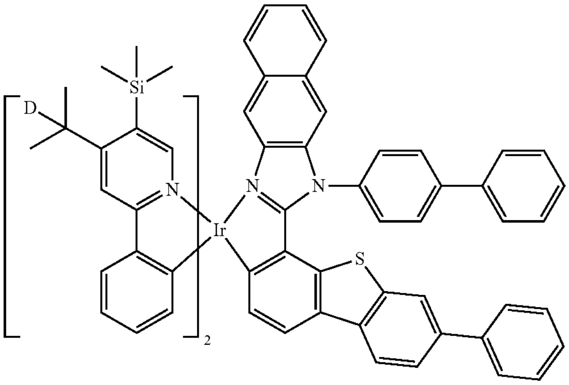

-continued
2559
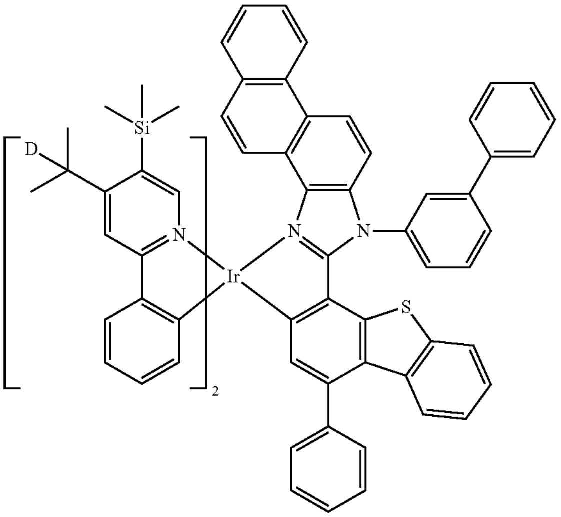
2560
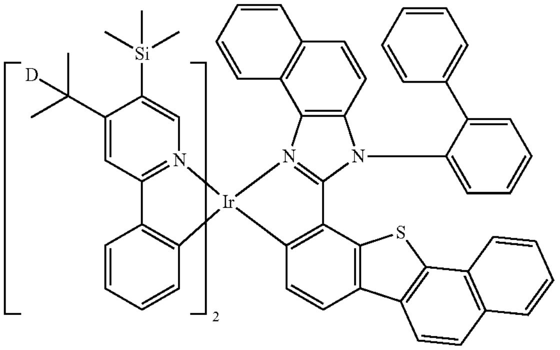
2561
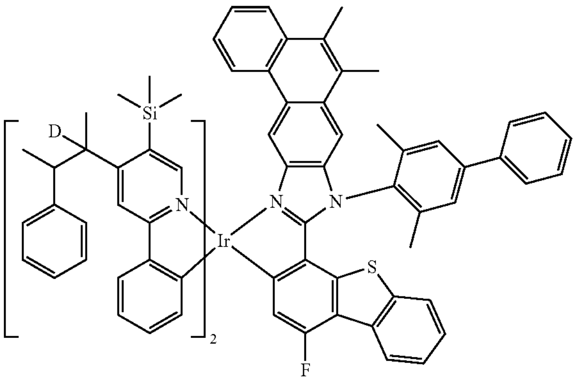
2562
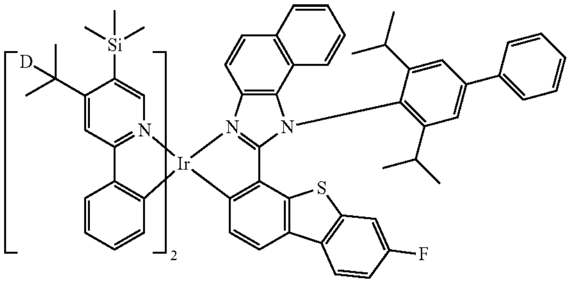
-continued
2563
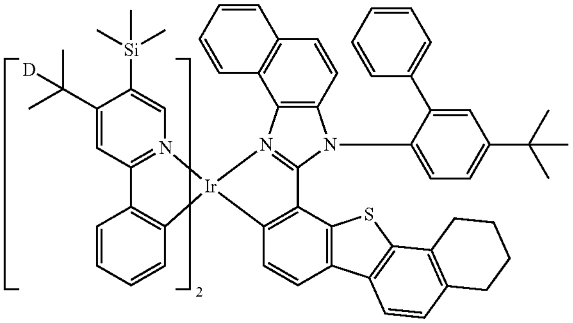
2564
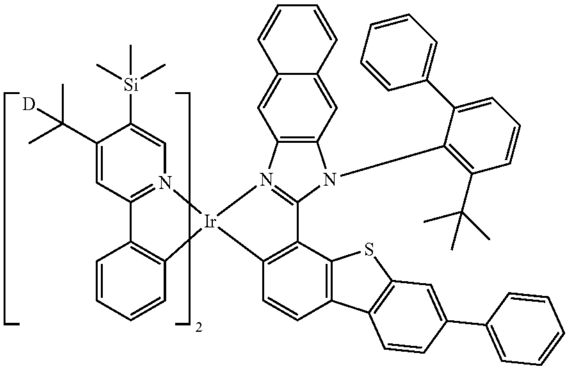
2565
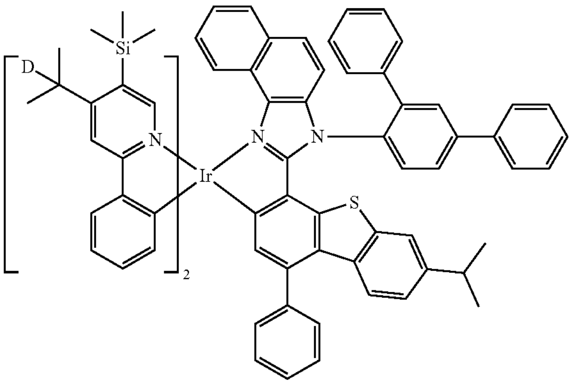
2566
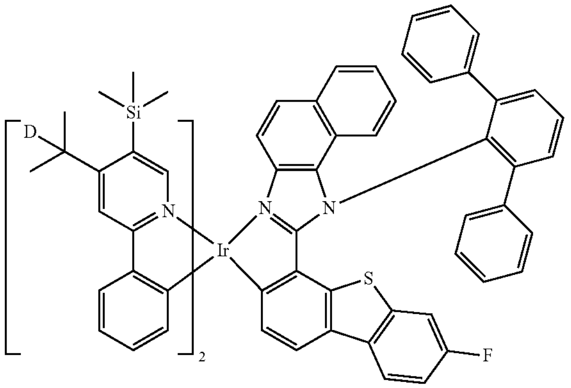

-continued
2567
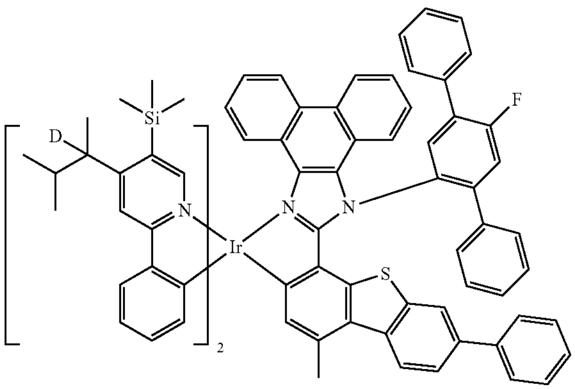
2568
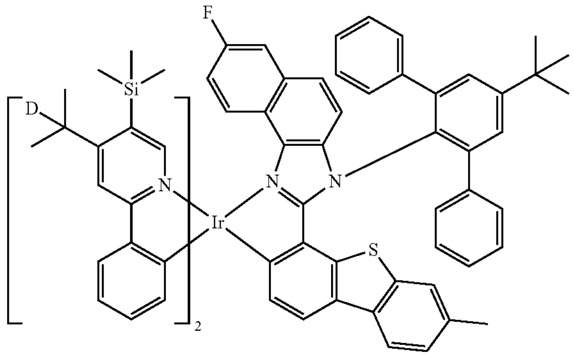
2569
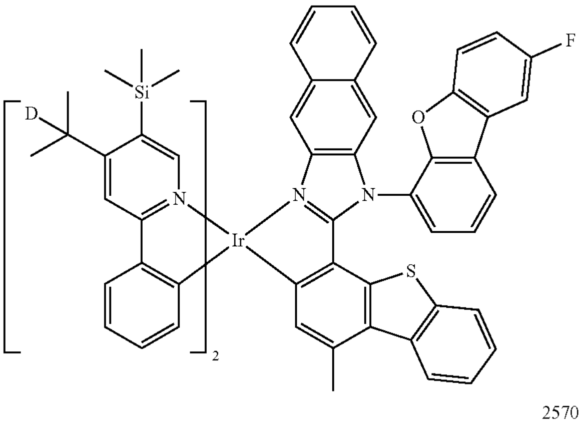
2570
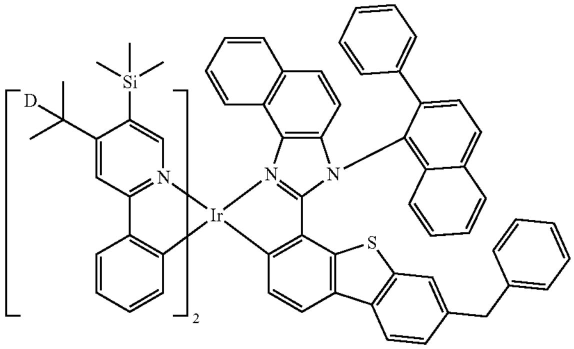
-continued
2571
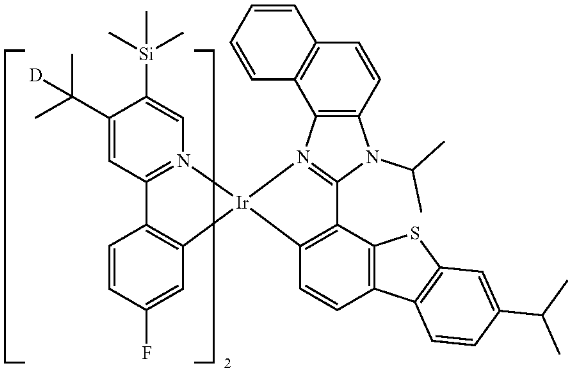
2572
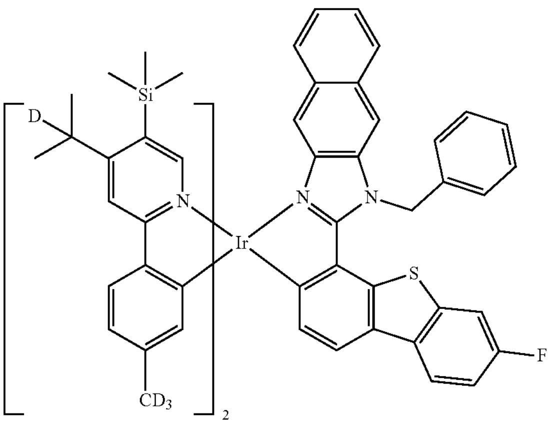
2573
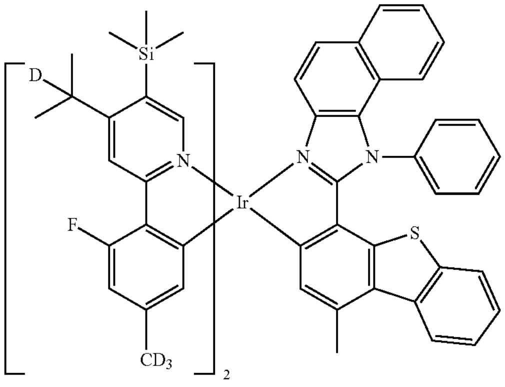

-continued
2574
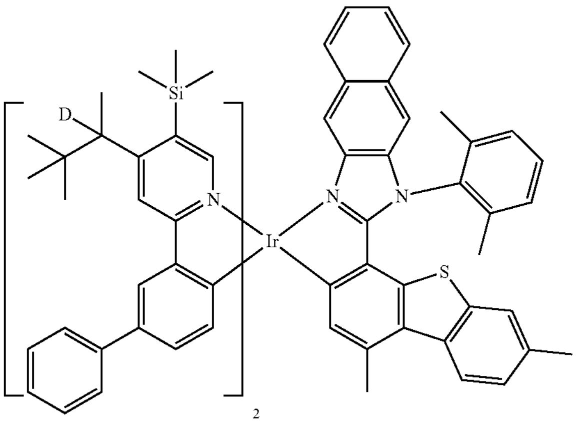
2575
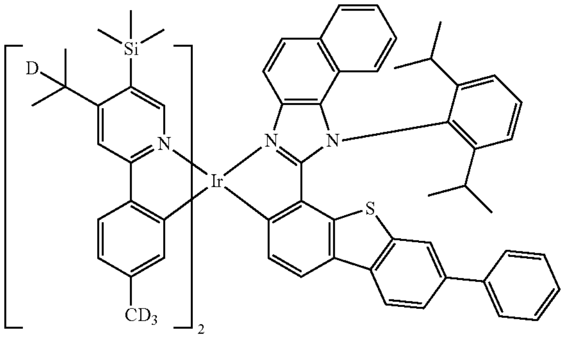
2576
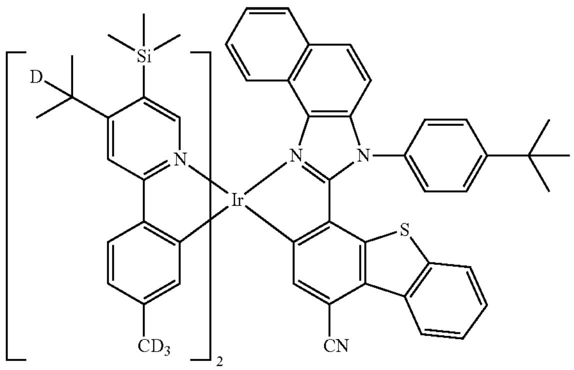
2577
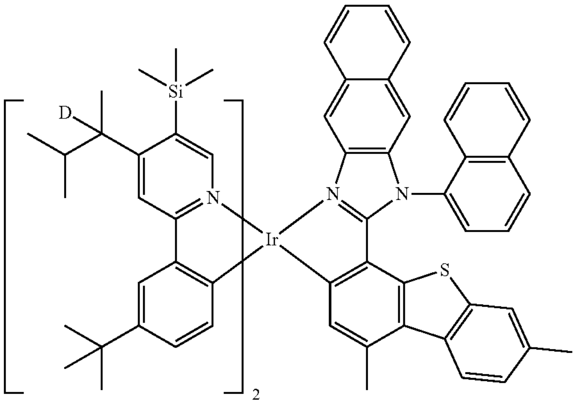
-continued
2578
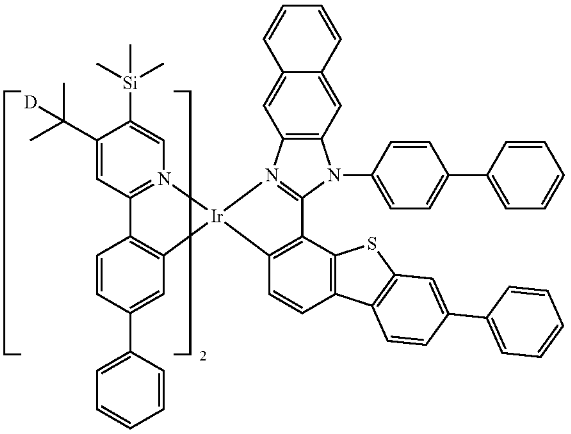
2579
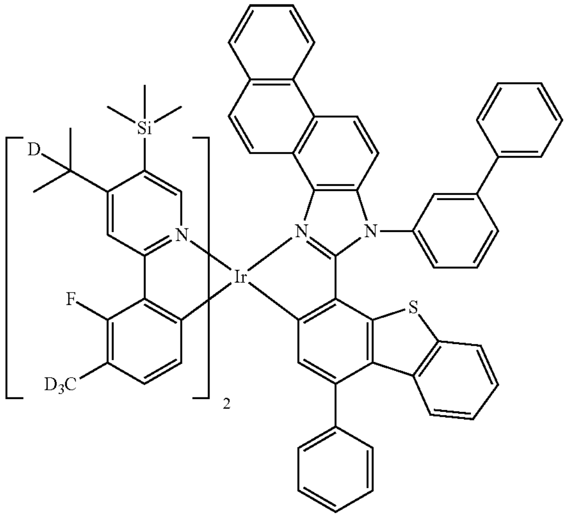
2580
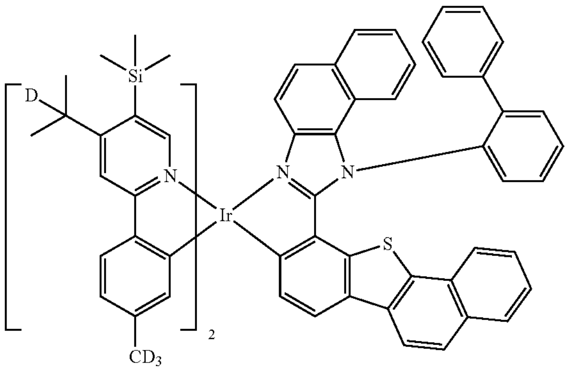

-continued
2581
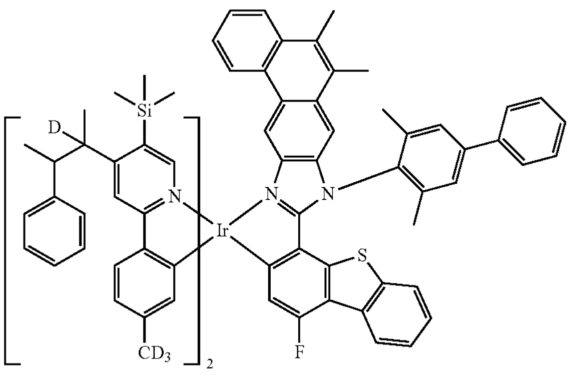
2582
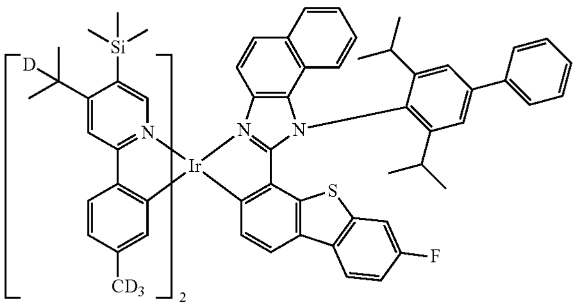
2583
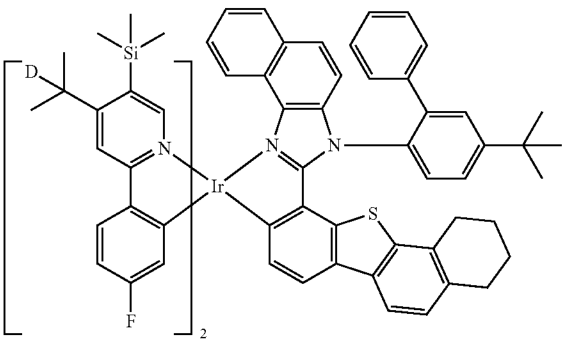
2584
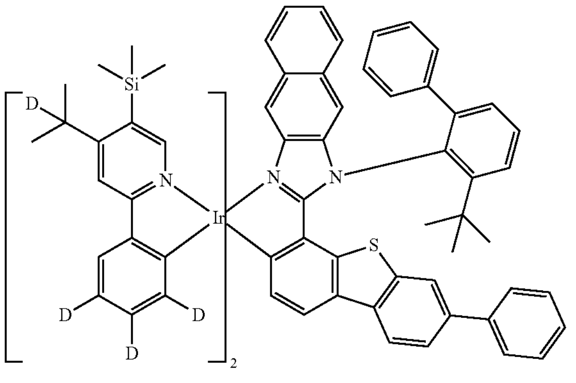
-continued
2585
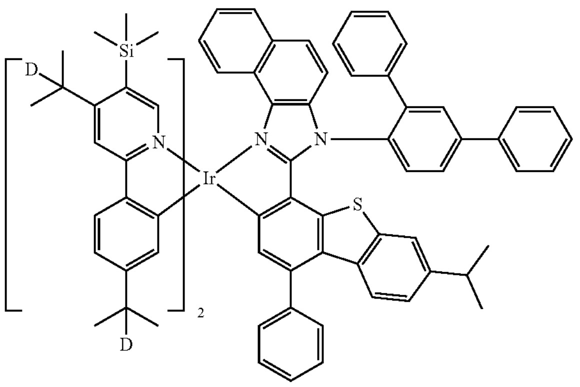
2586
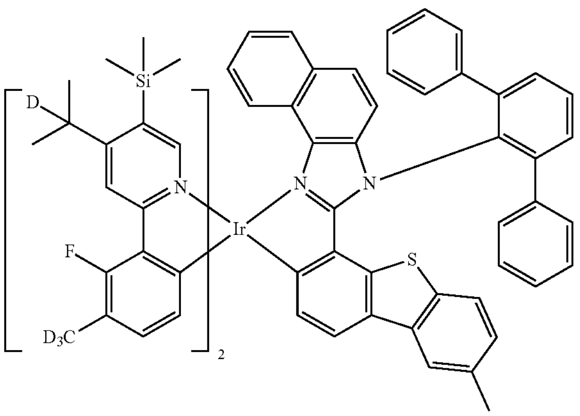
2587
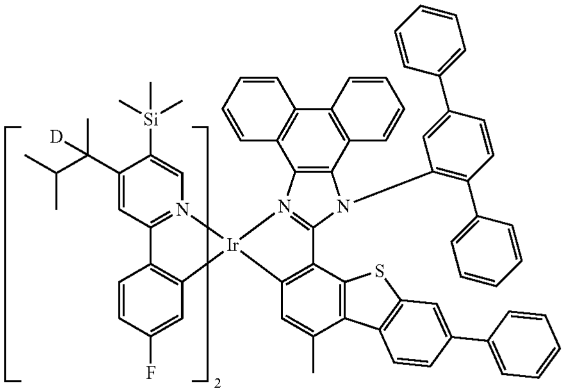
2588
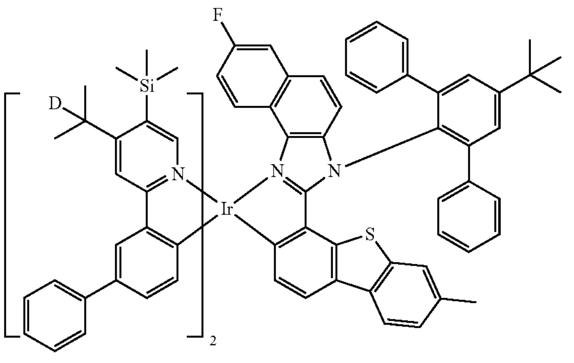

-continued
2589
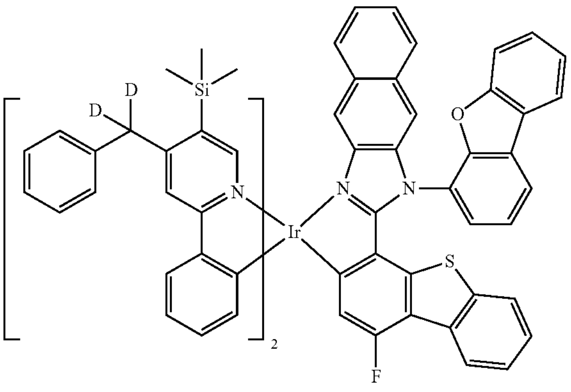
2590
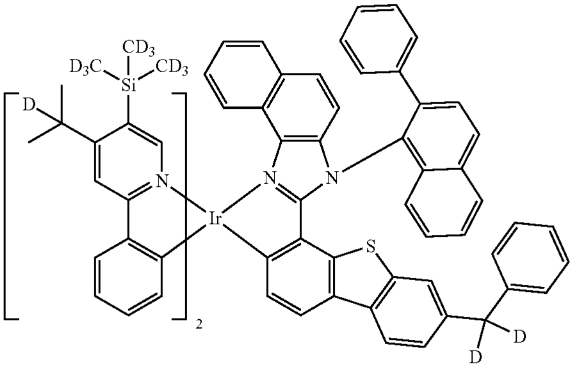
2591
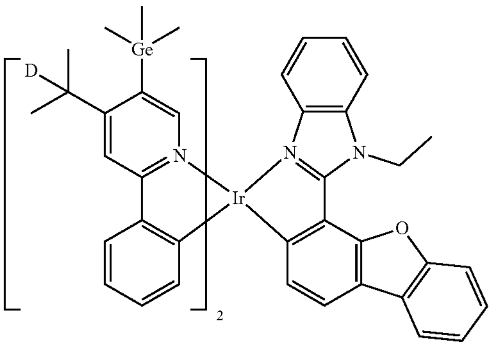
2592
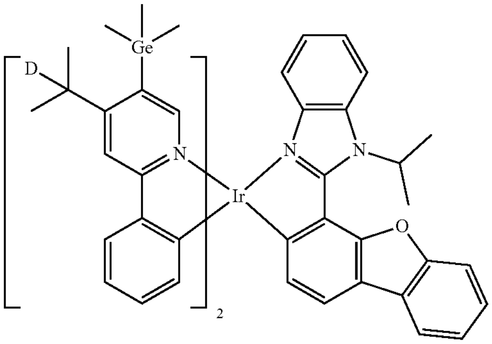
2593
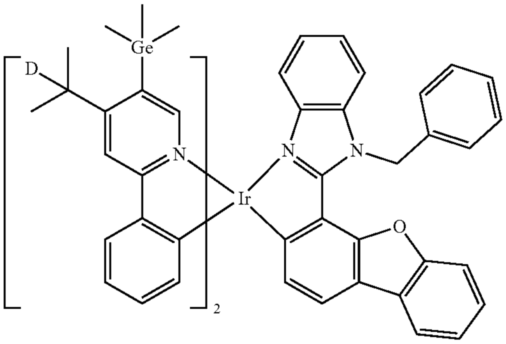
2594
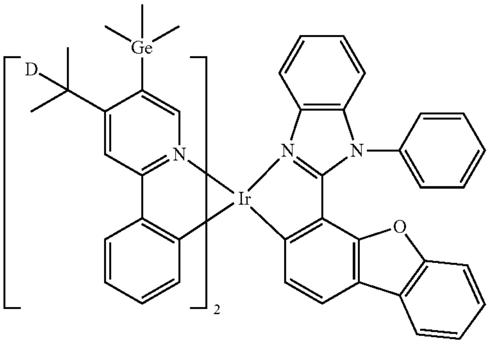
2595
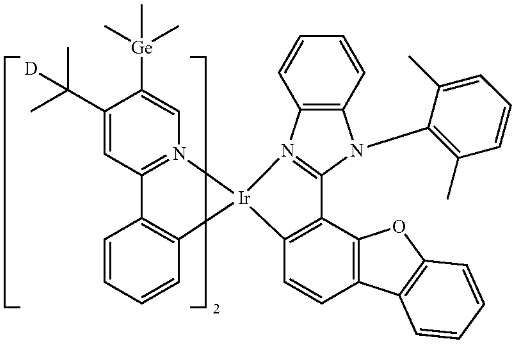
2596
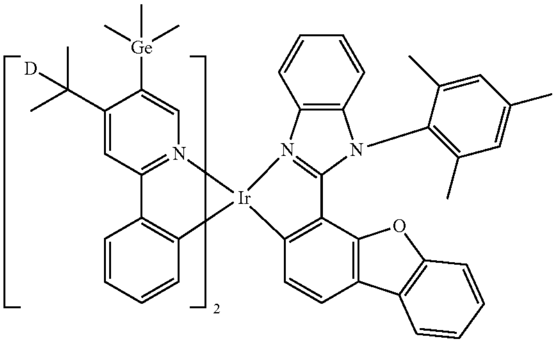

2597
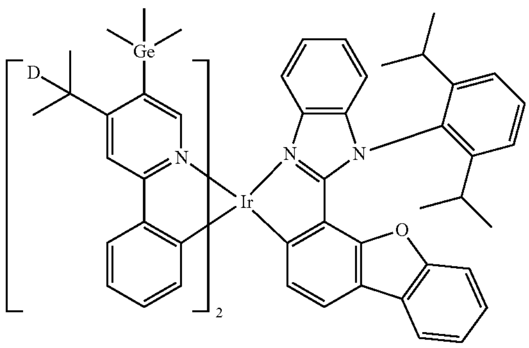
2598
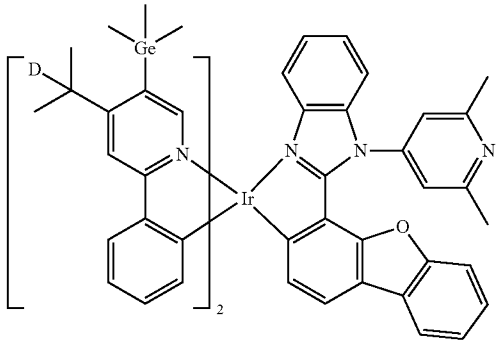
2599
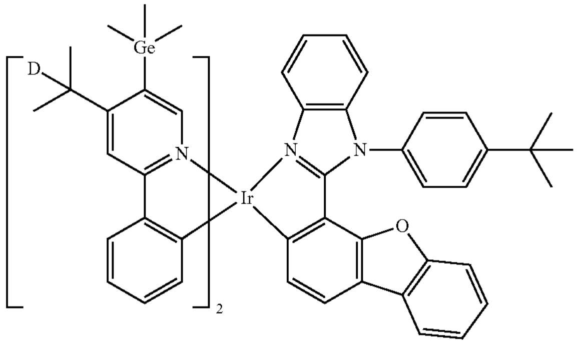
2600
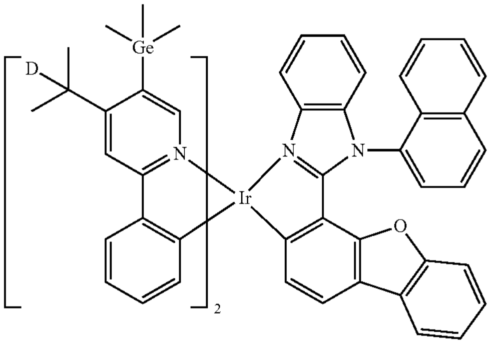
2601
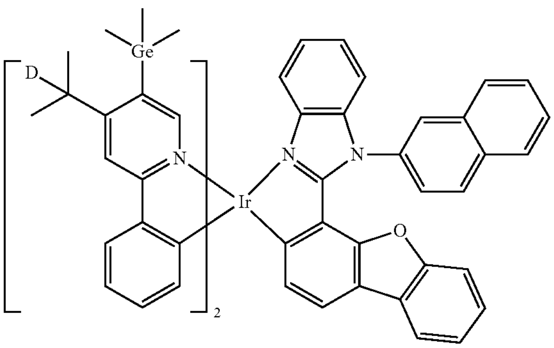
2602
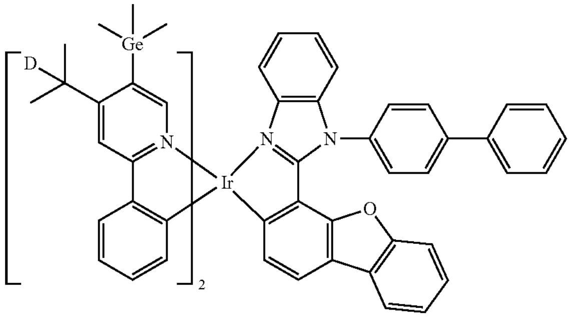
2603
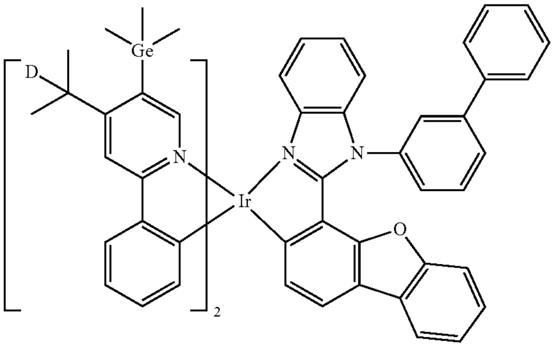
2604
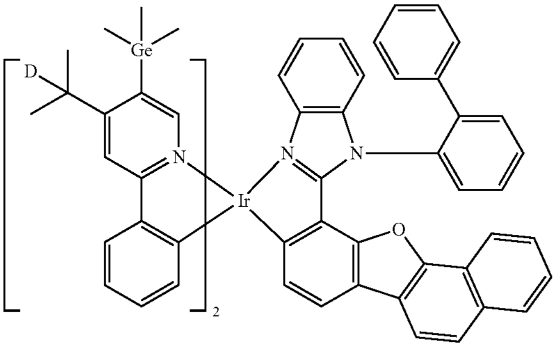

-continued
2605
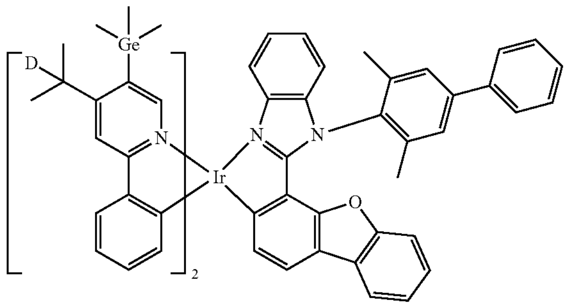
2606
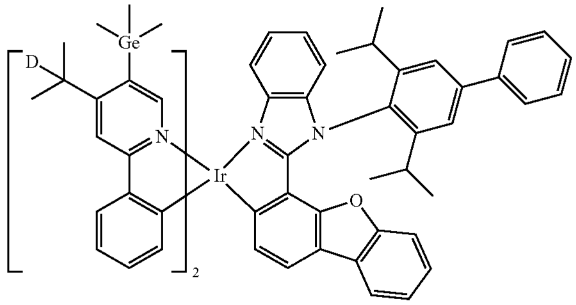
2607
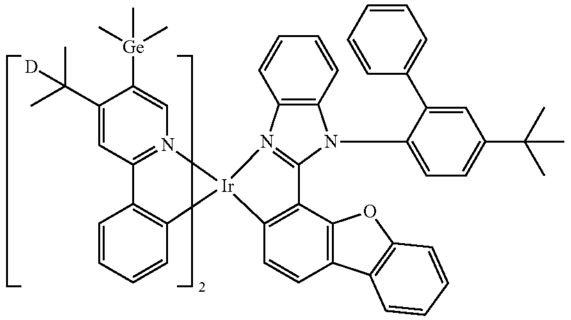
2608
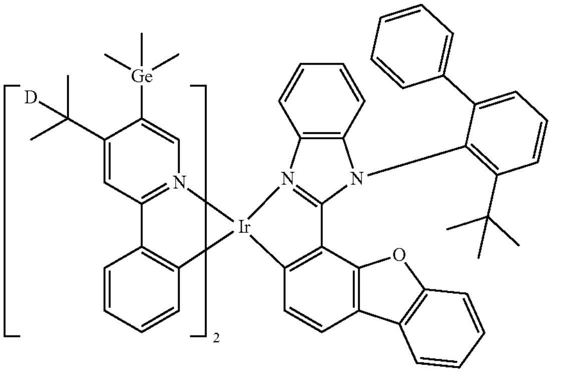
-continued
2609
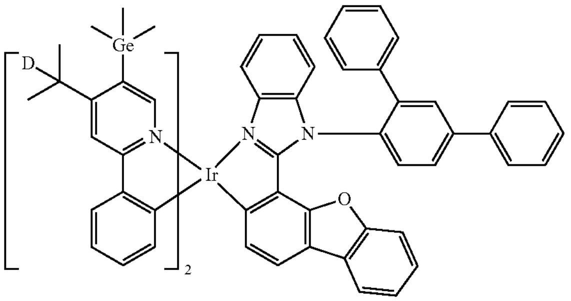
2610
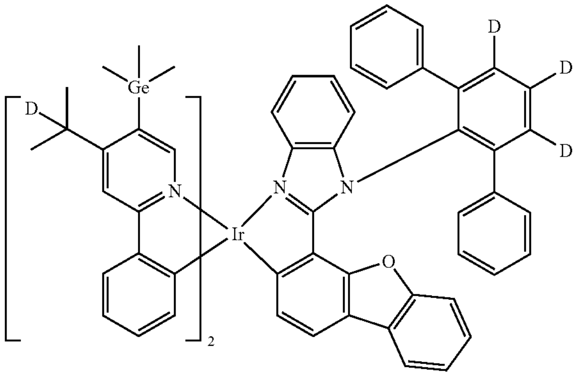
2611
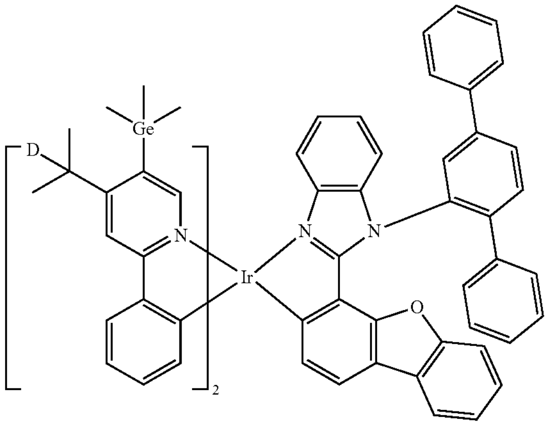
2612
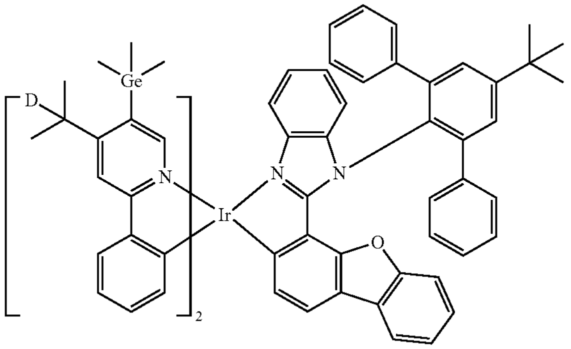

-continued
2613
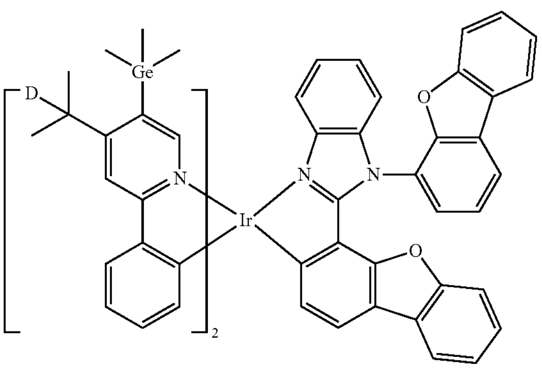
2614
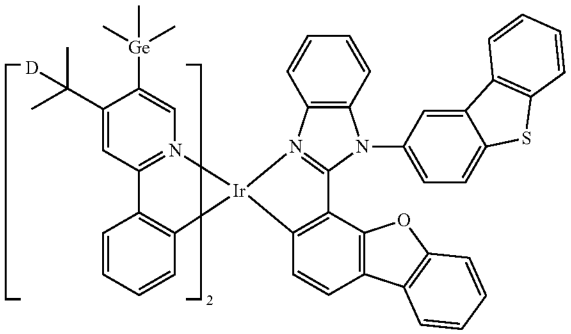
2615
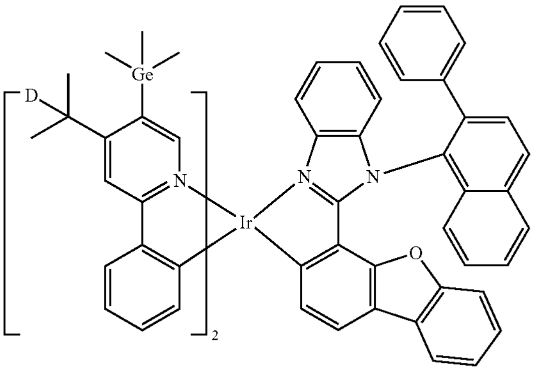
2616
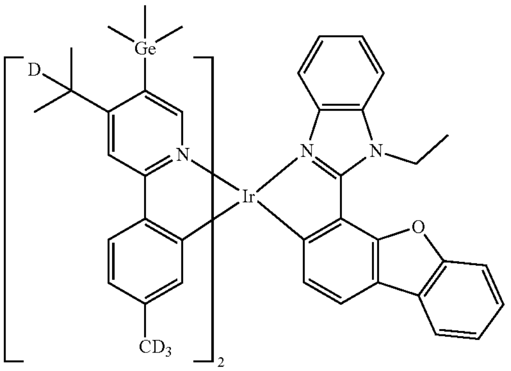
-continued
2617
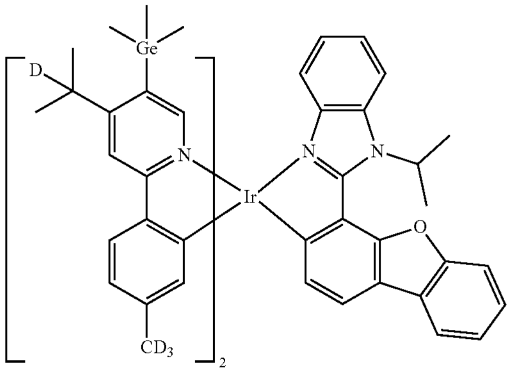
2618
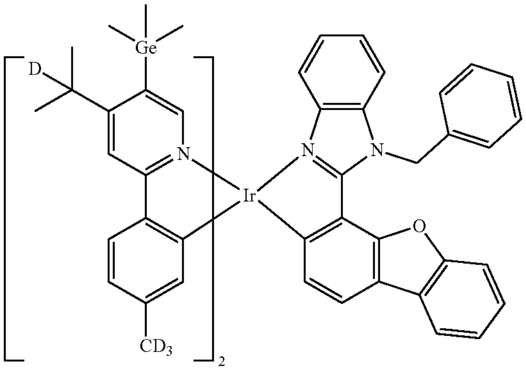
2619
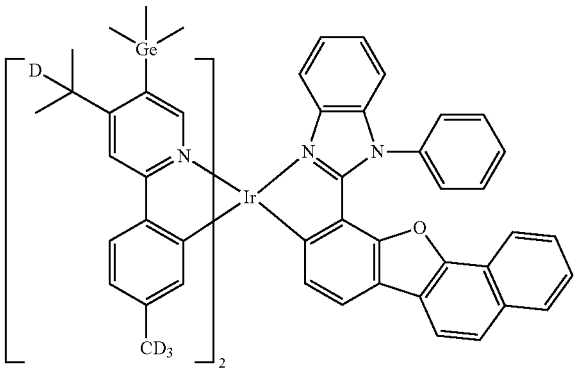
2620
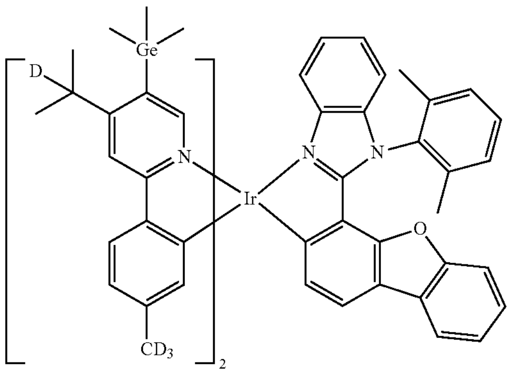

-continued
2621
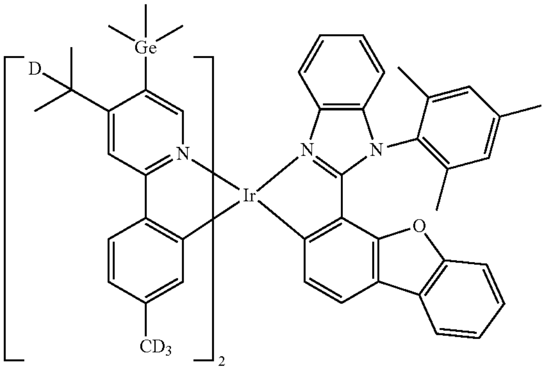
2622
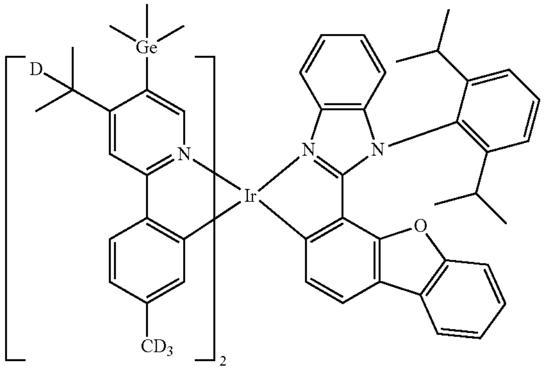
2623
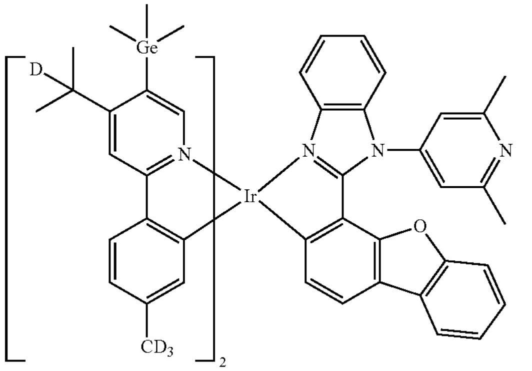
2624
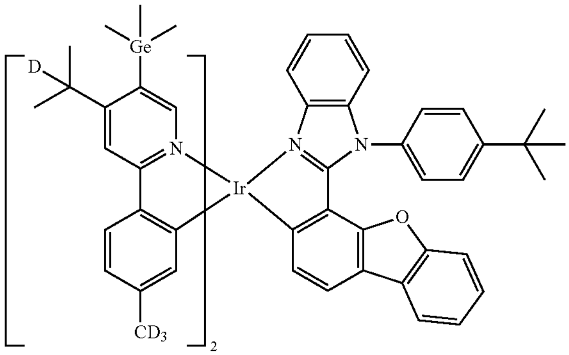
-continued
2625
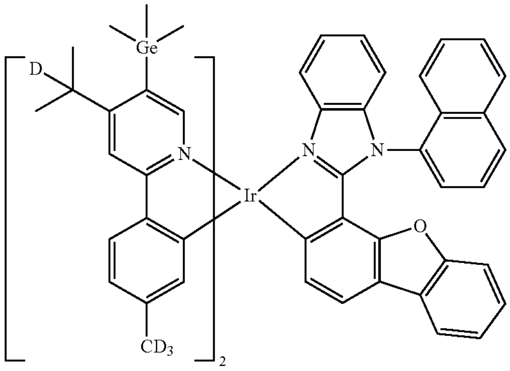
2626
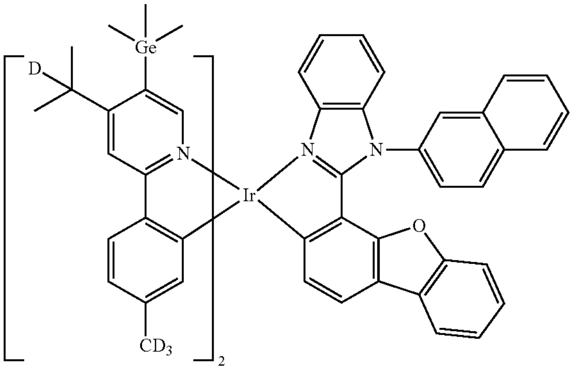
2627
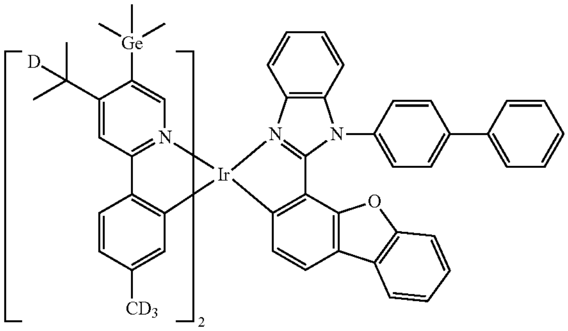
2628
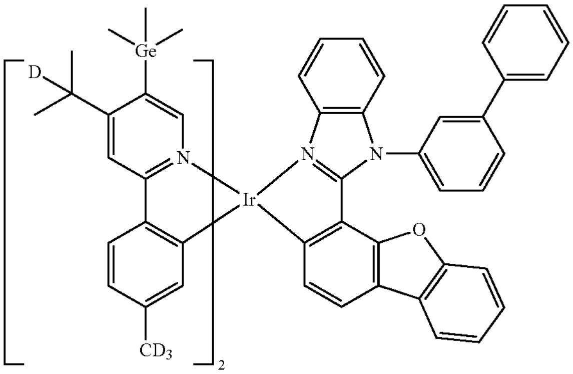

-continued
2629
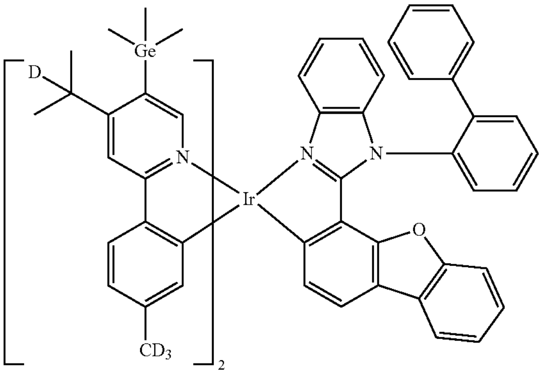
2630
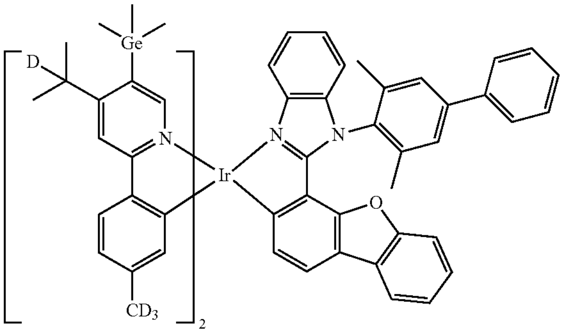
2631
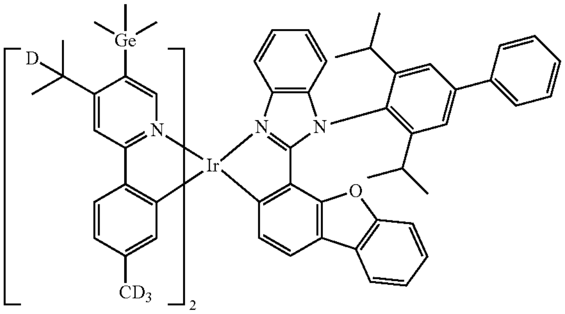
2632
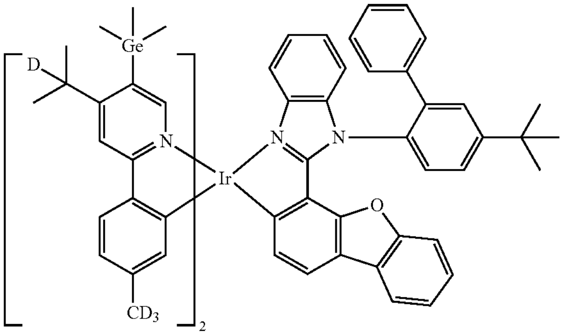
-continued
2633
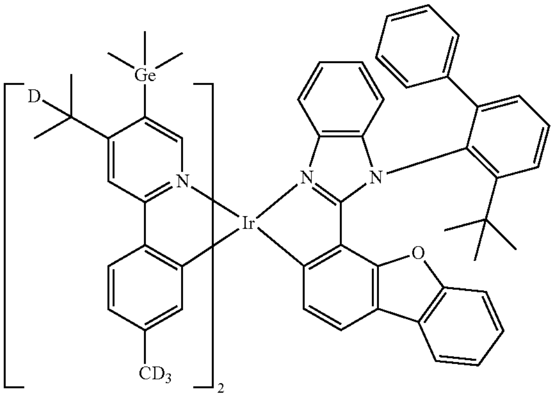
2634
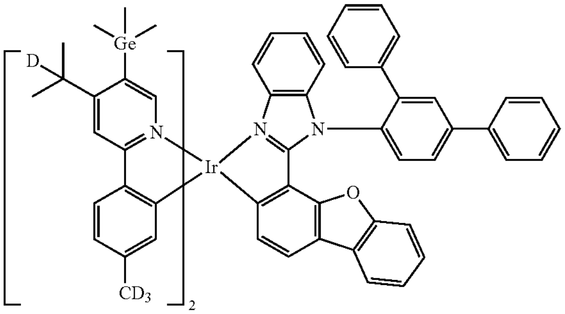
2635
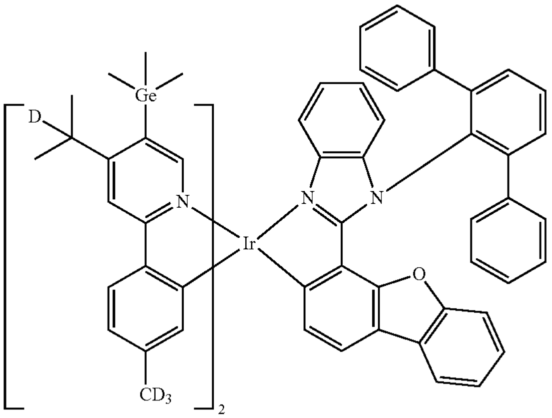

-continued
2636
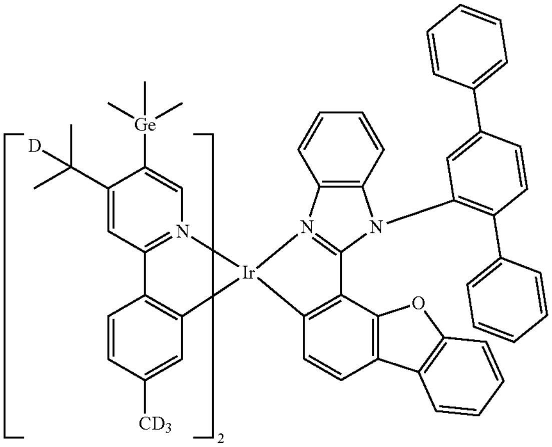
2637
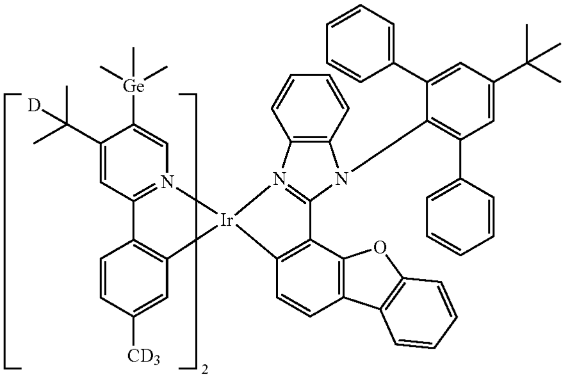
2638
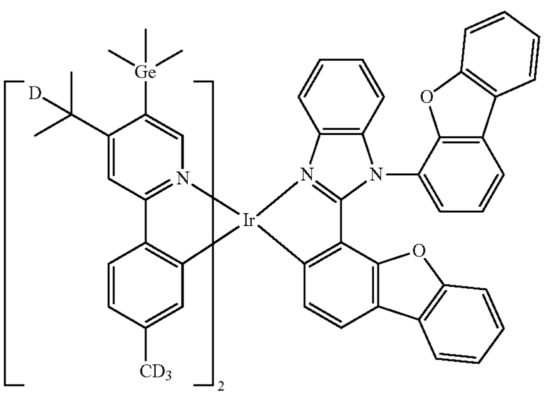
-continued
2639
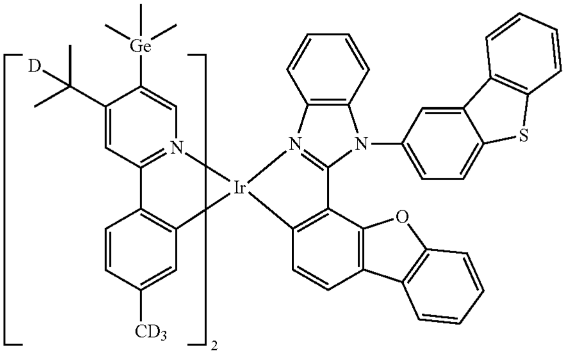
2640
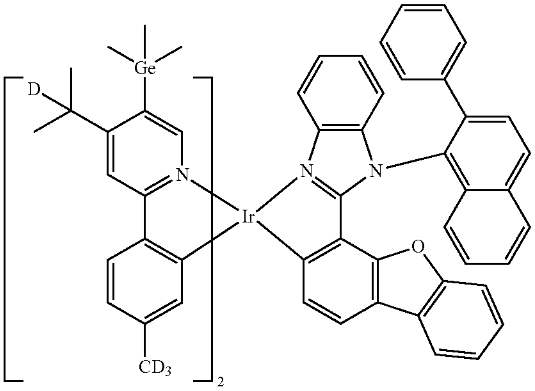
2641
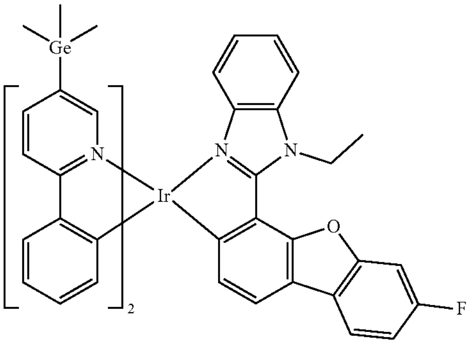
2642
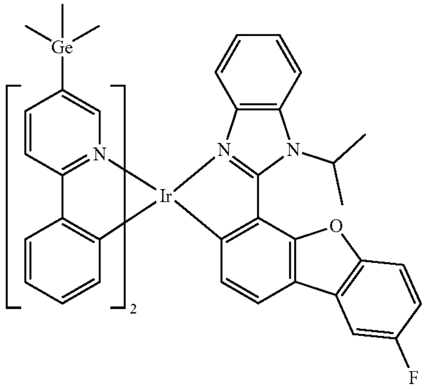

-continued
2643
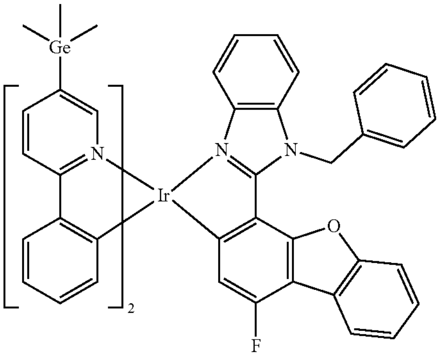
2644
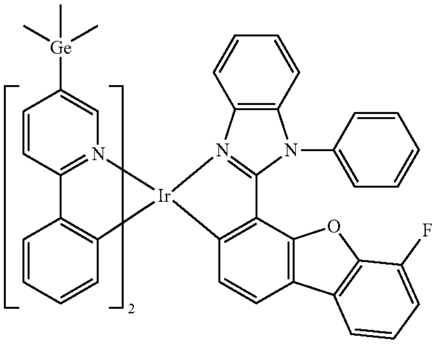
2645
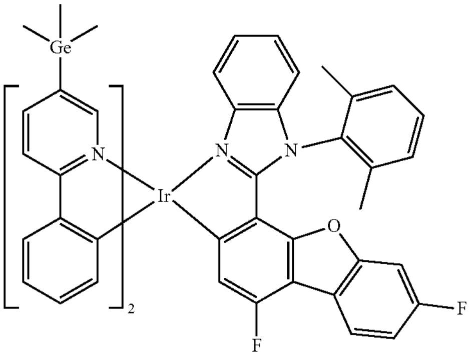
2646
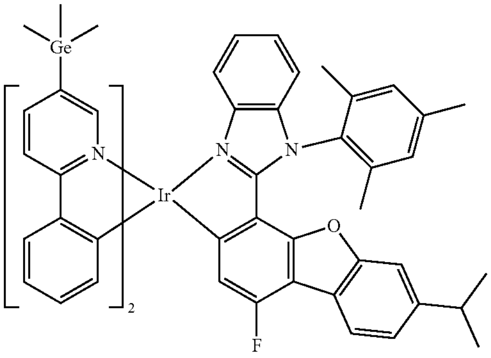
-continued
2647
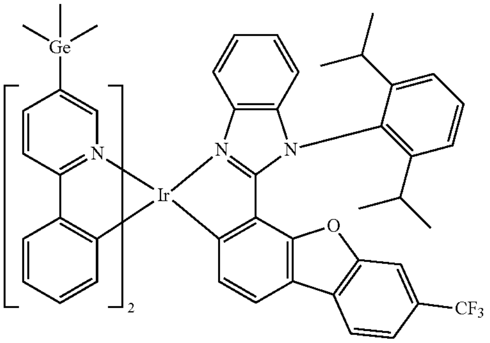
2648
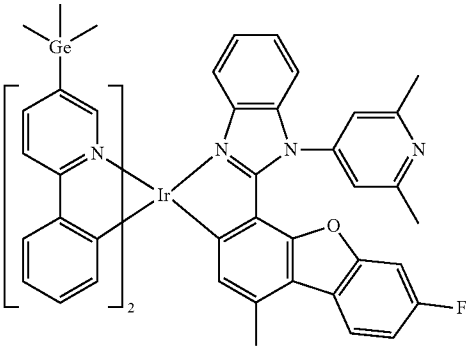
2649
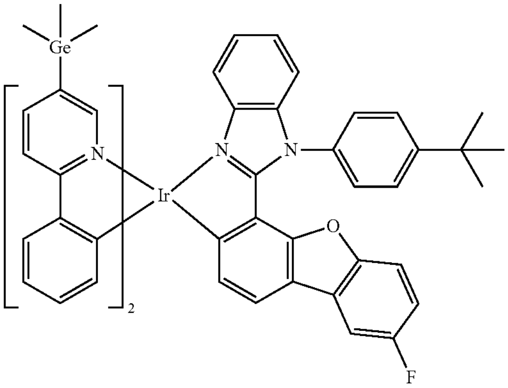
2650
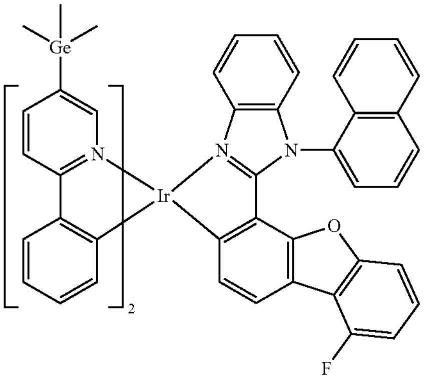

-continued
2651
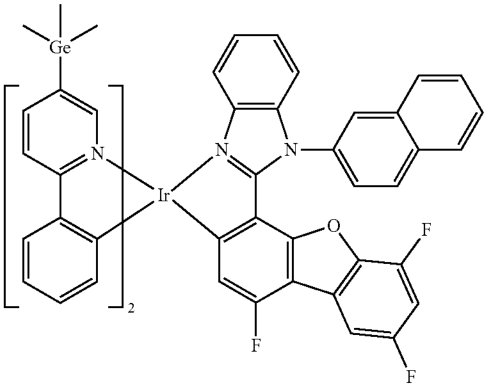
2652
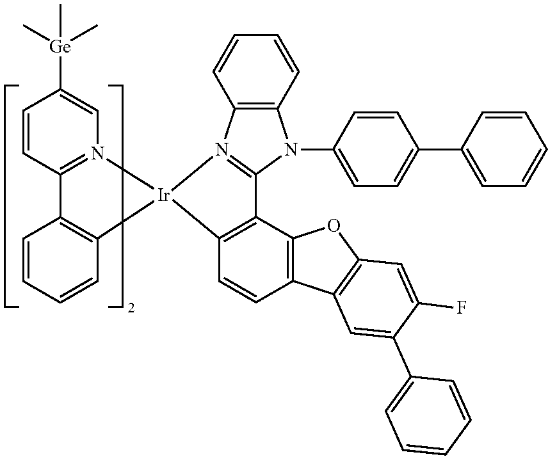
2653
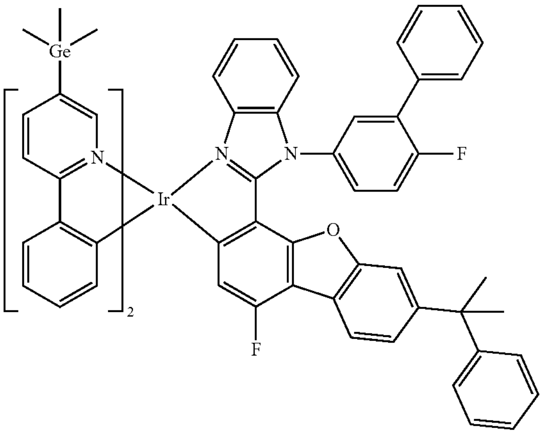
-continued
2654
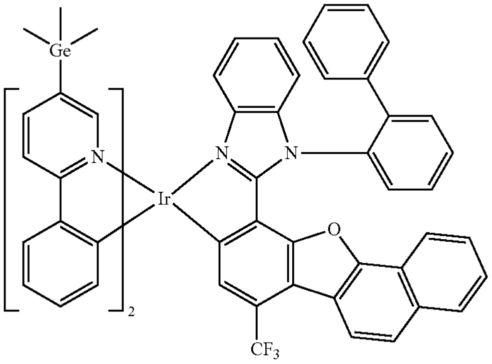
2655
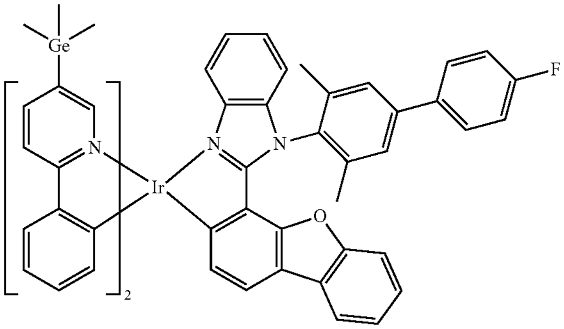
2656
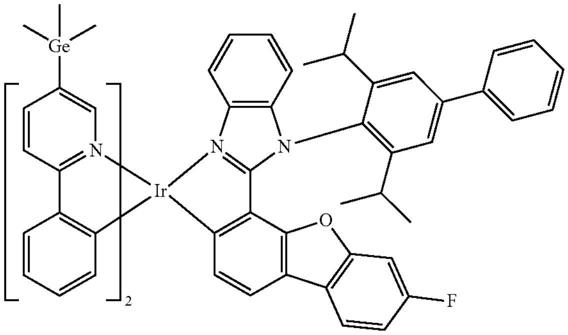
2657
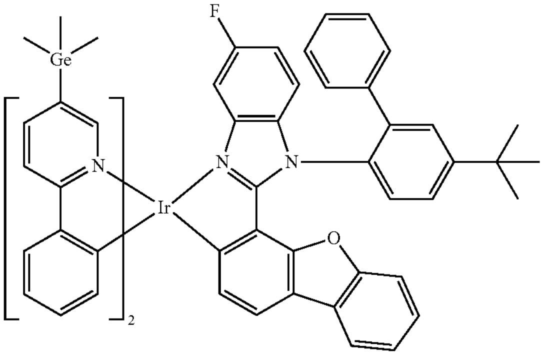

2658
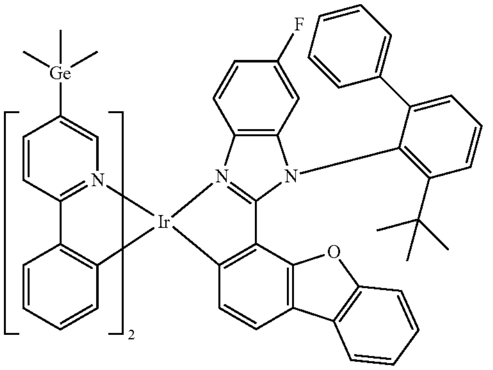
2659
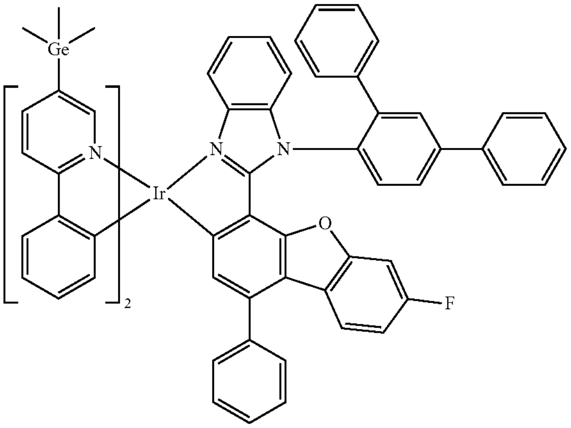
2660
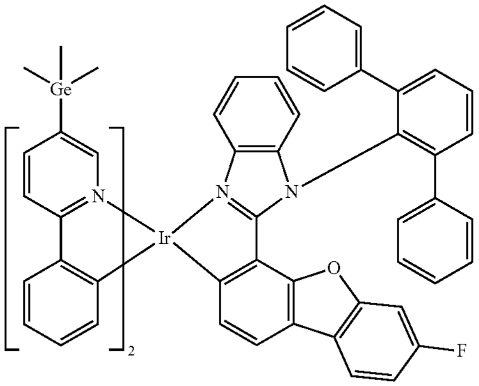
2661
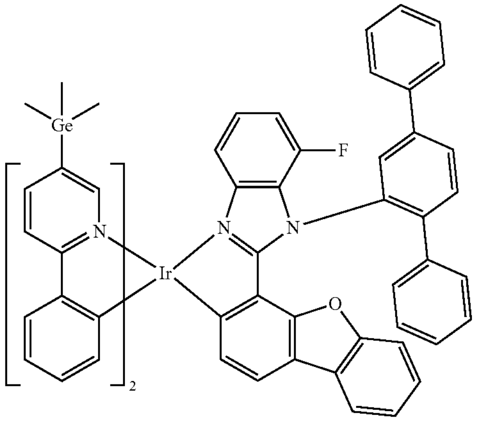
2662
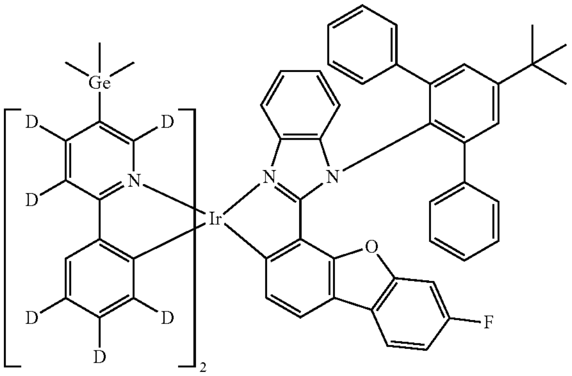
2663
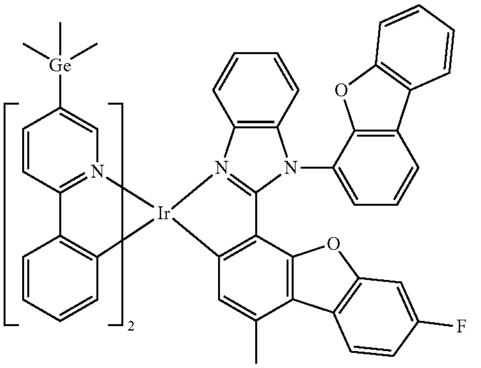
2664
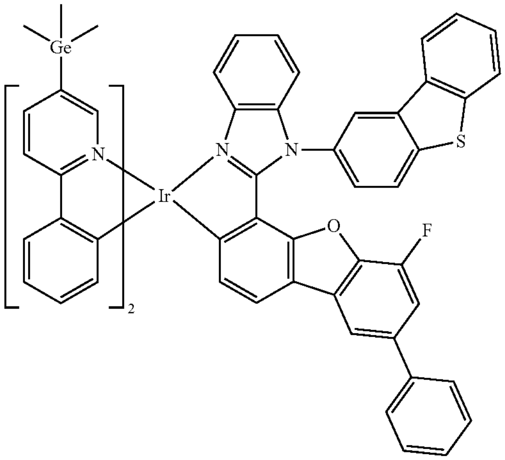
2665
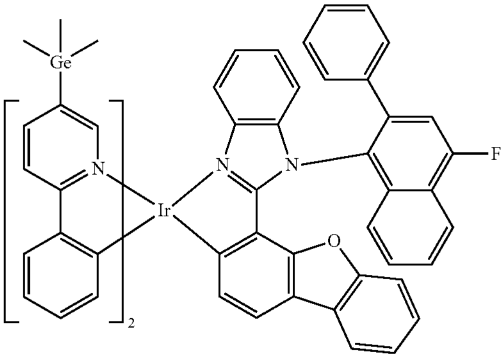

-continued
2666
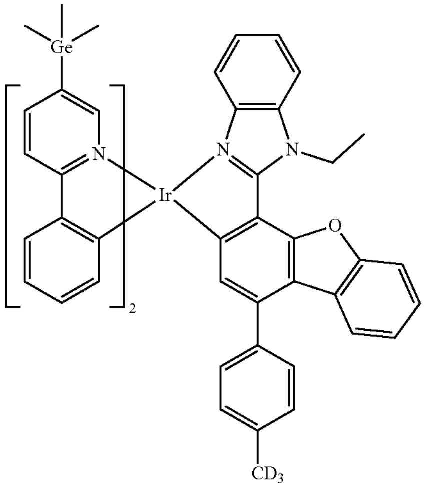
2667
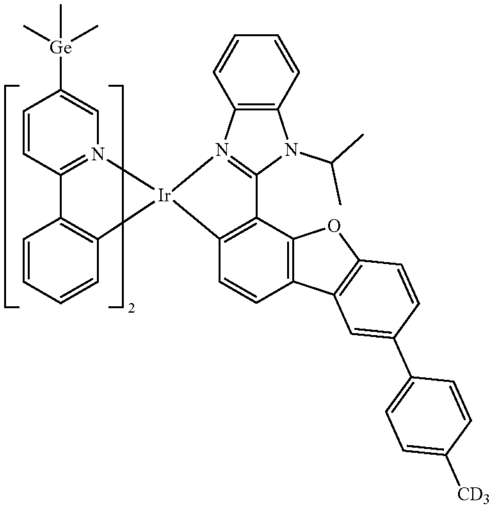
2668
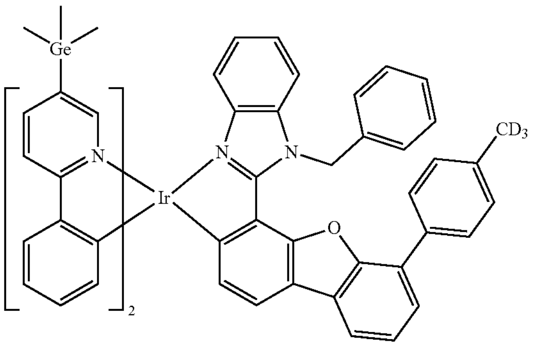
-continued
2669
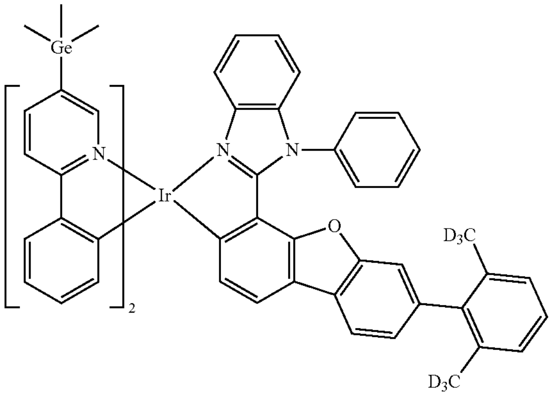
2670
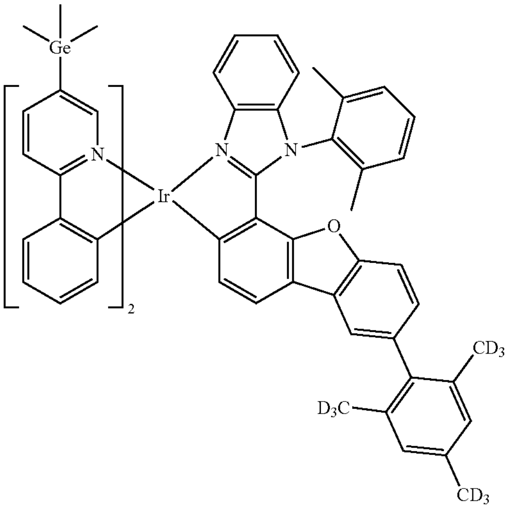
2671
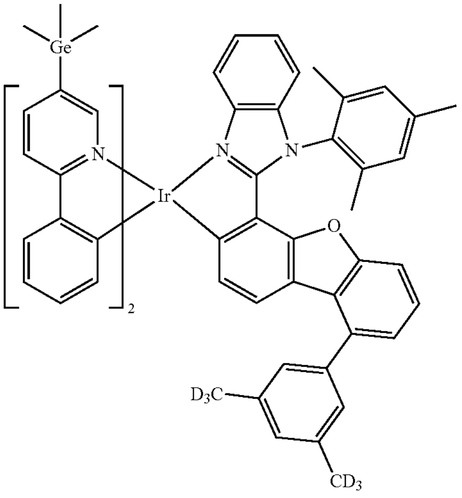

-continued
2672
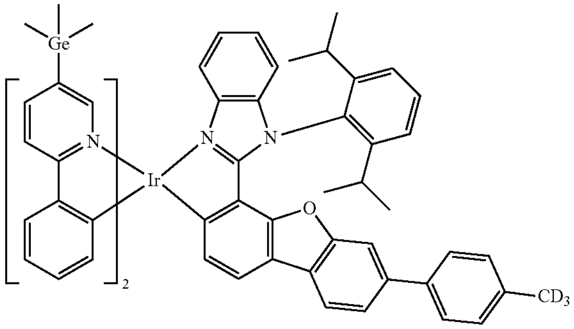
2673
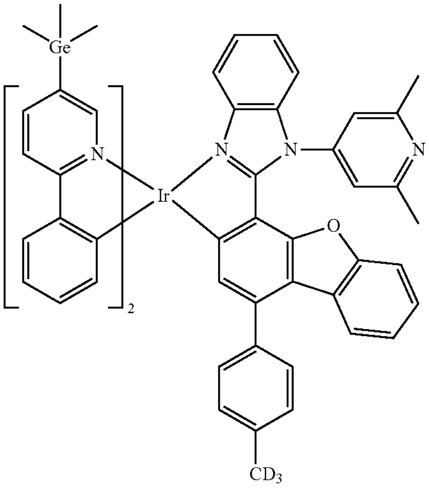
2674
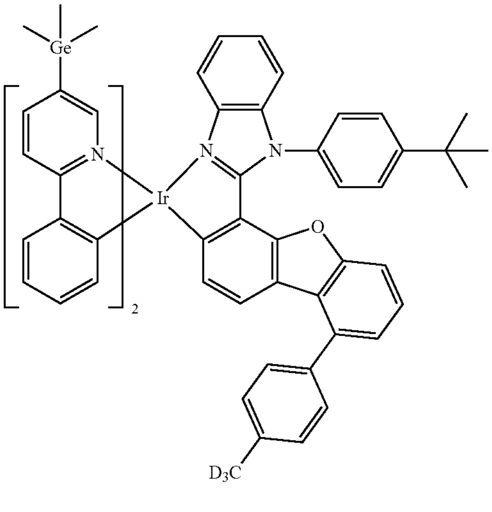
-continued
2675
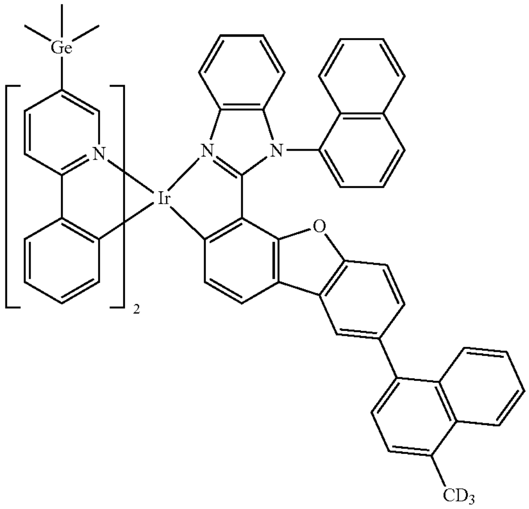
2676
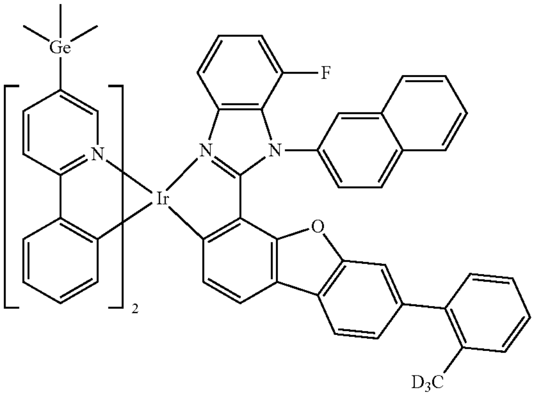
2677
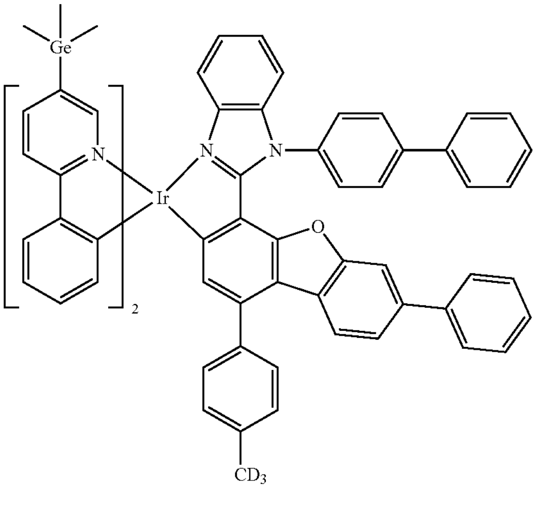

-continued
2678
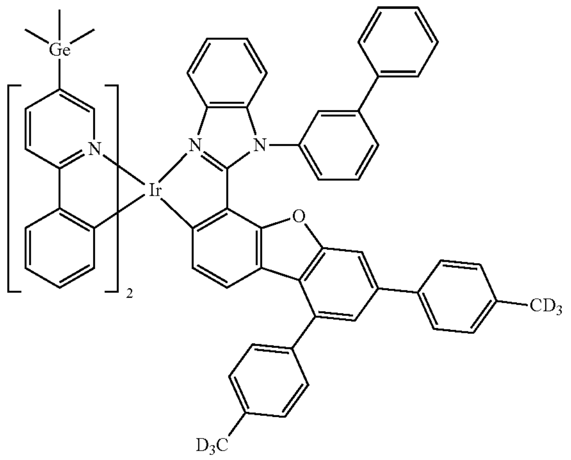
2679
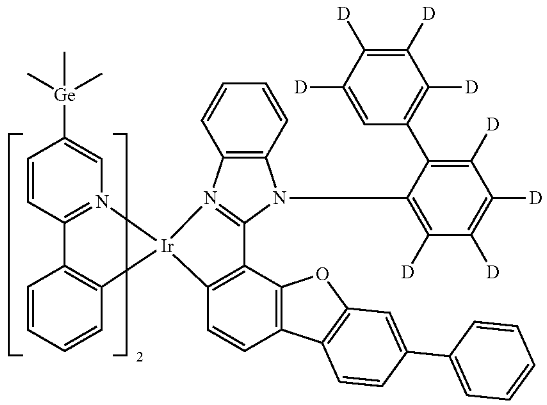
2680
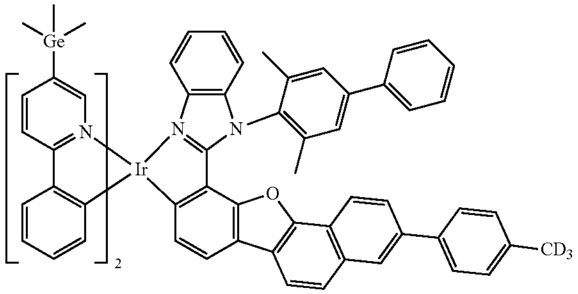
2681
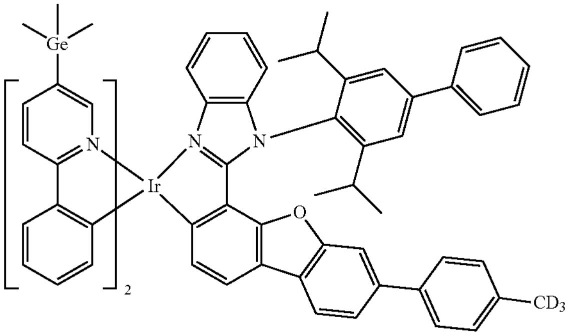
-continued
2682
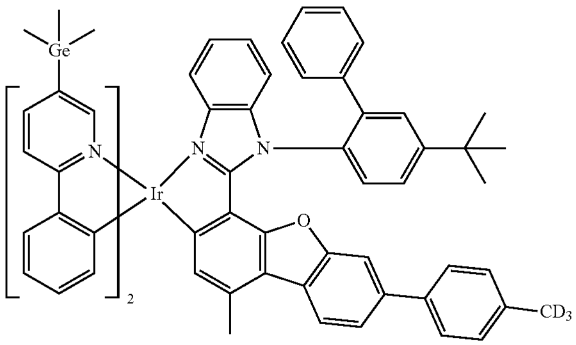
2683
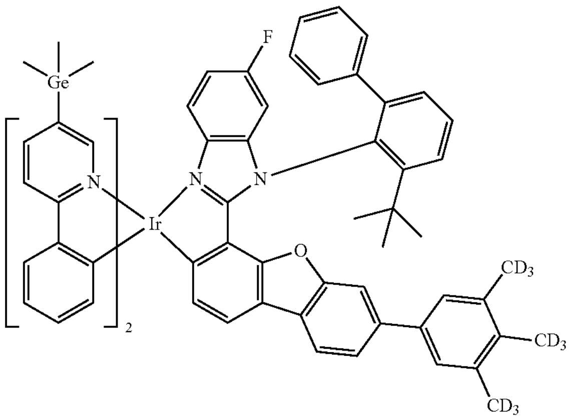
2684
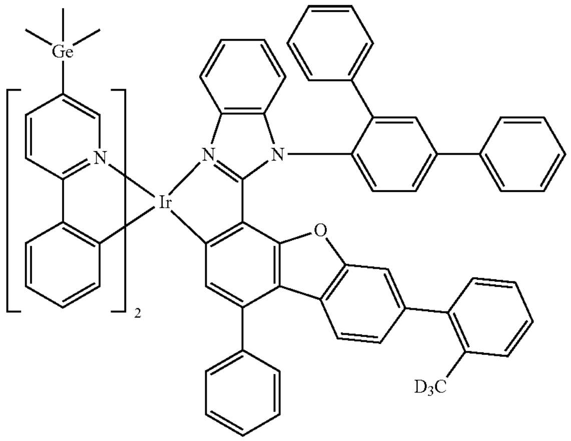

-continued
2685
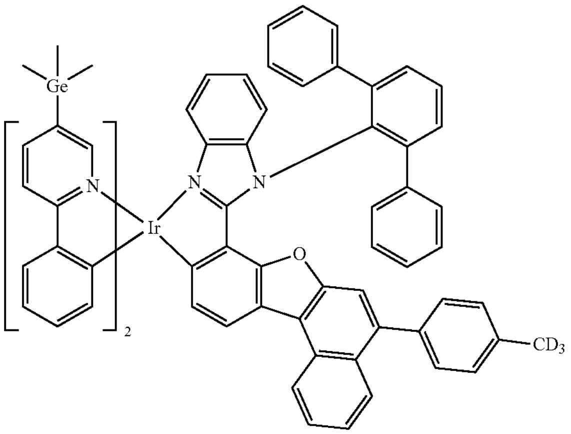
2686
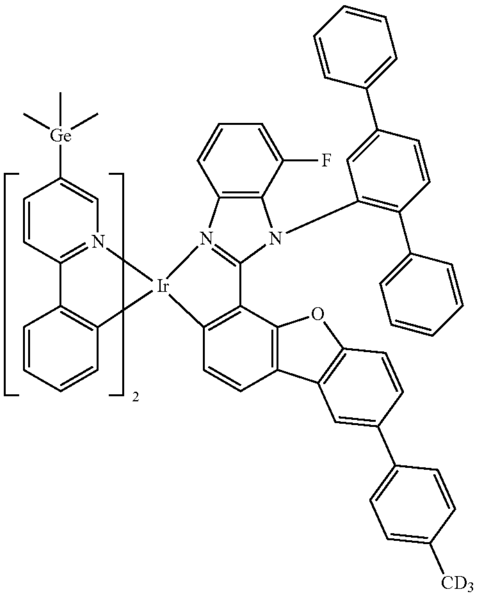
2687
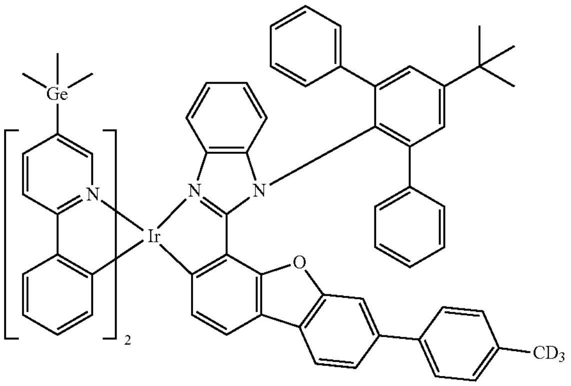
-continued
2688
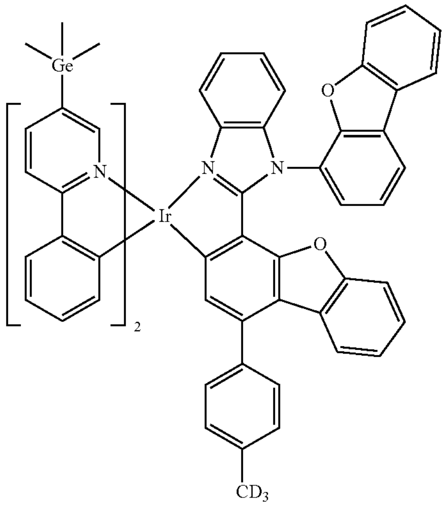
2689
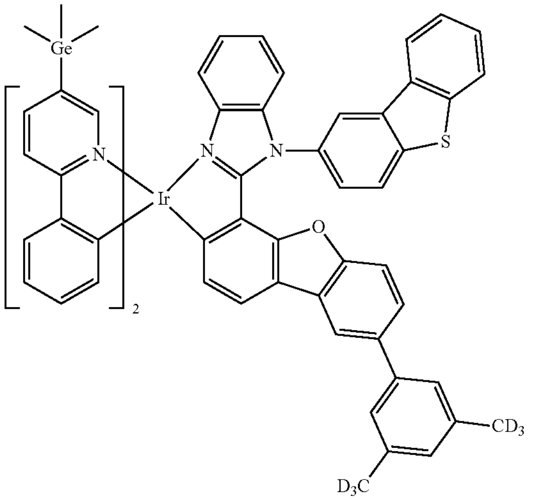
2690
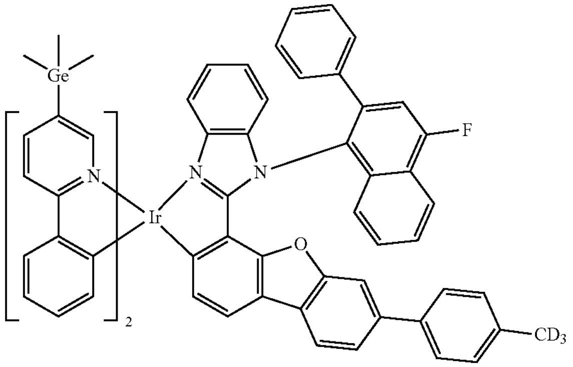

2691
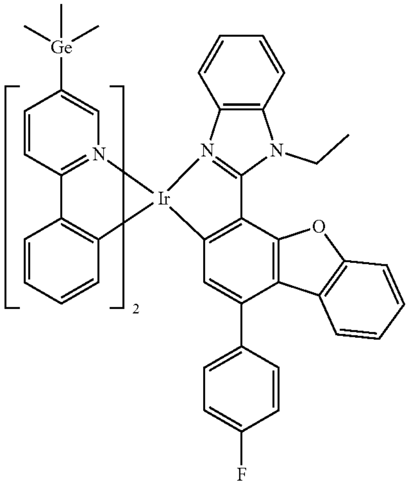
2692
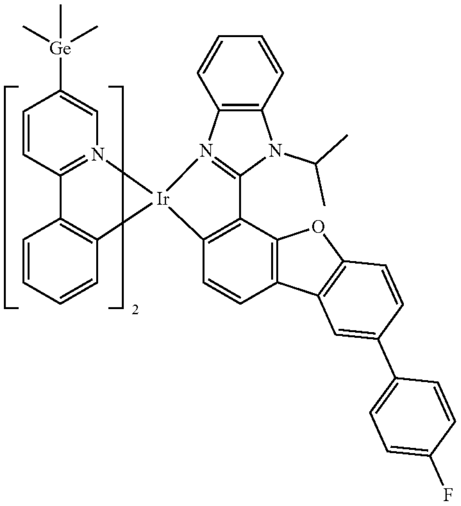
2693
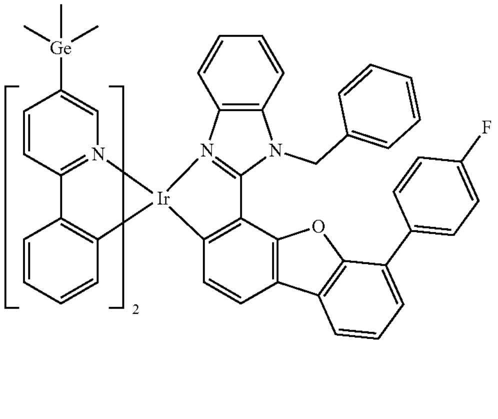
2694
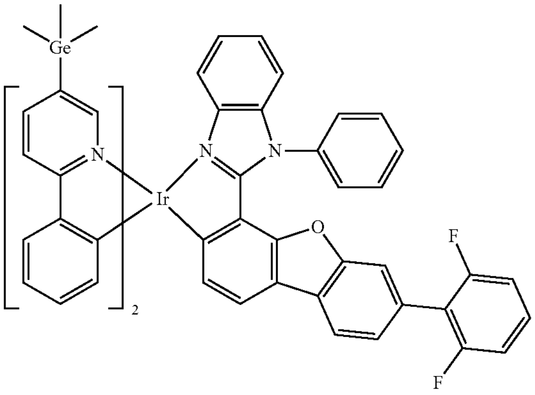
2695
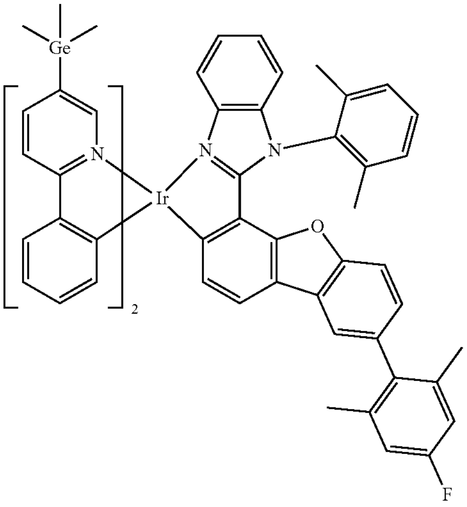
2696
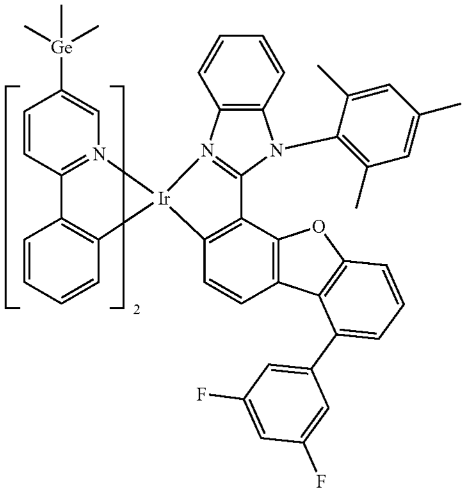

-continued
2697
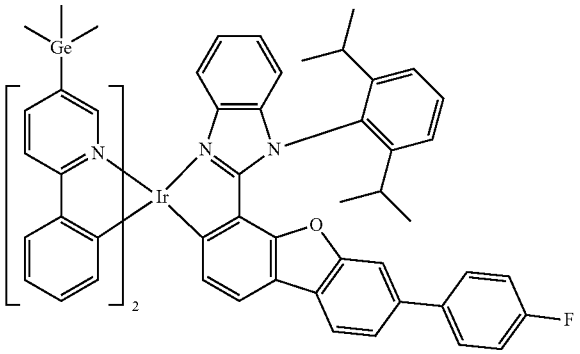
2698
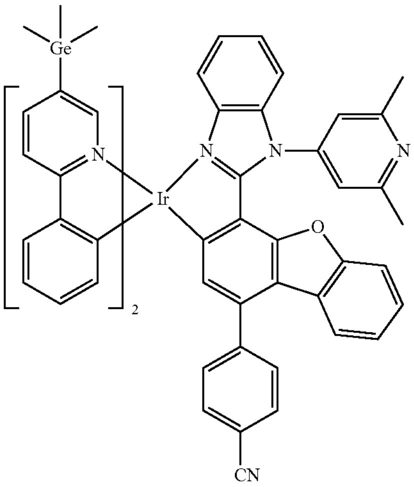
2699
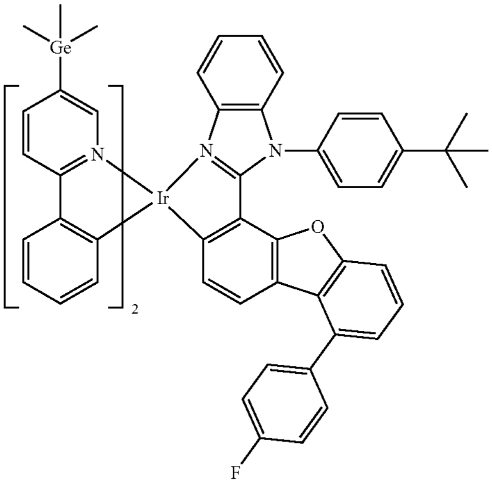
-continued
2700
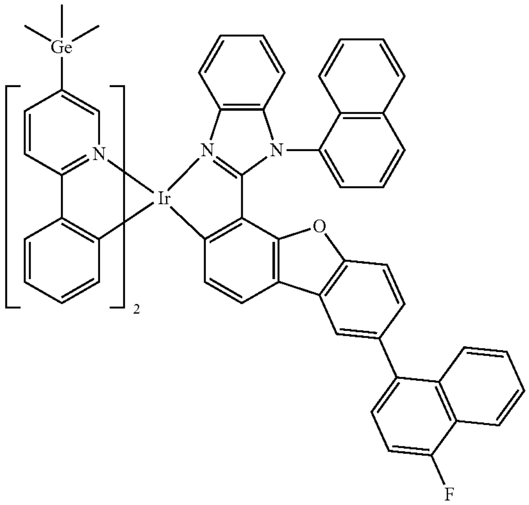
2701
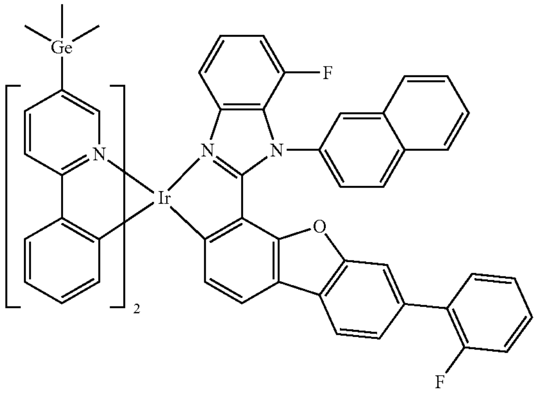
2702
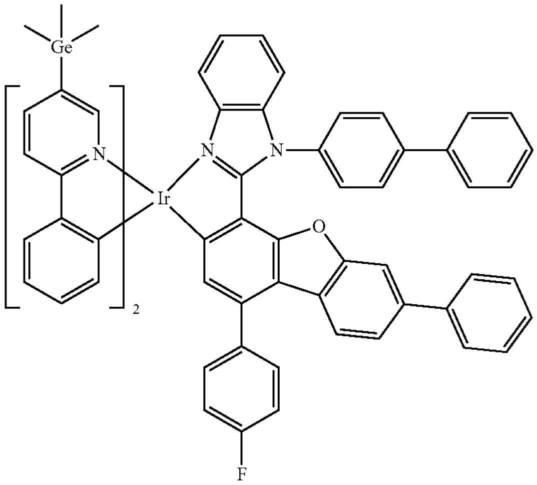

2703
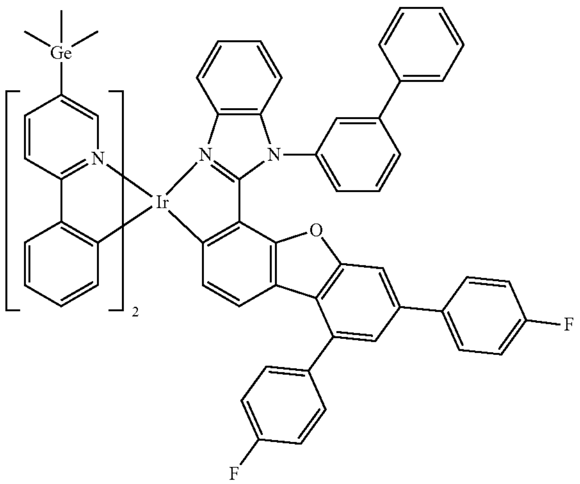
2704
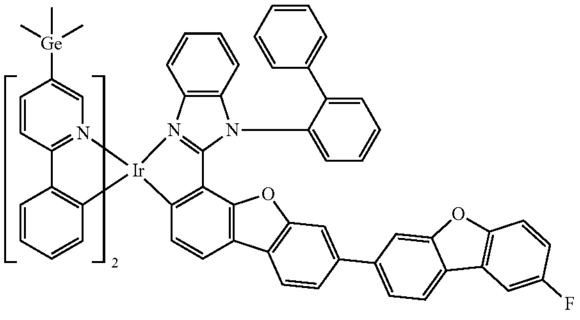
2705
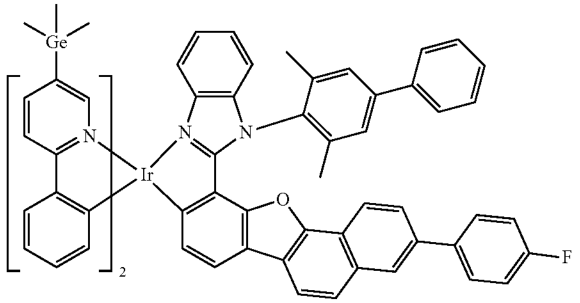
2706
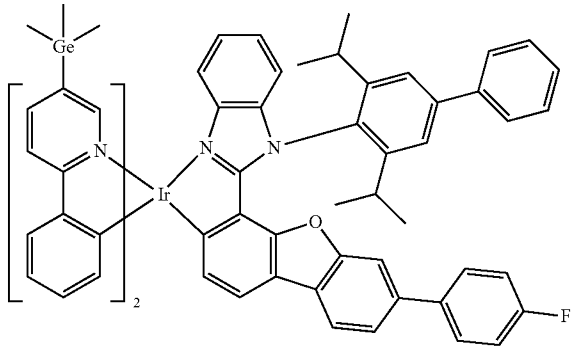
2707
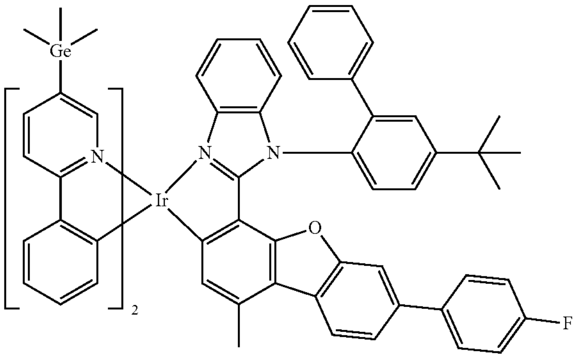
2708
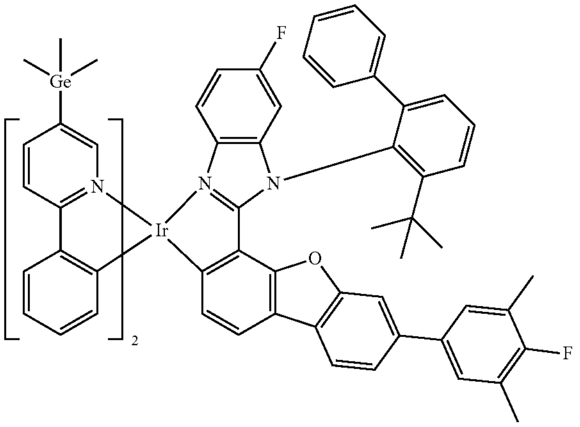
2709
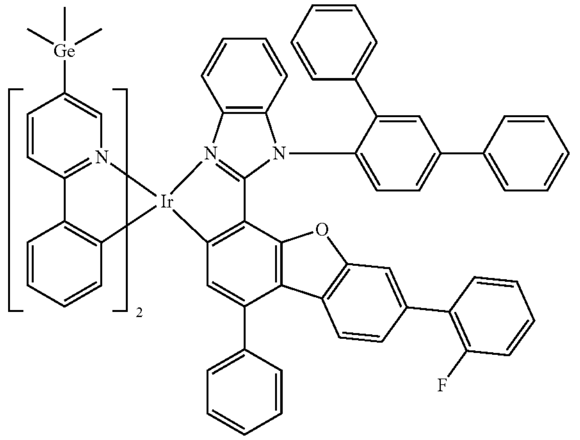

-continued
2710
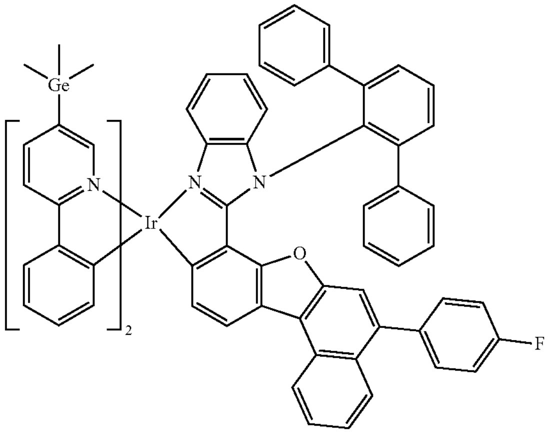
2713
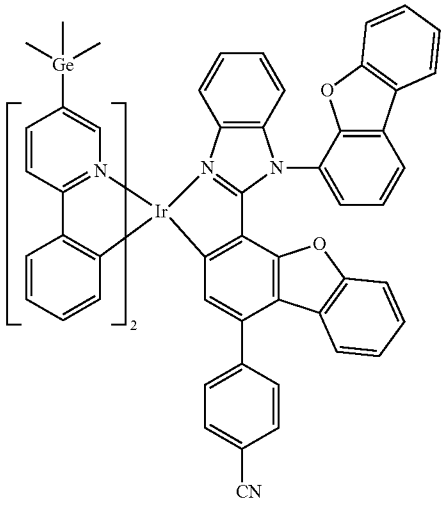
2711
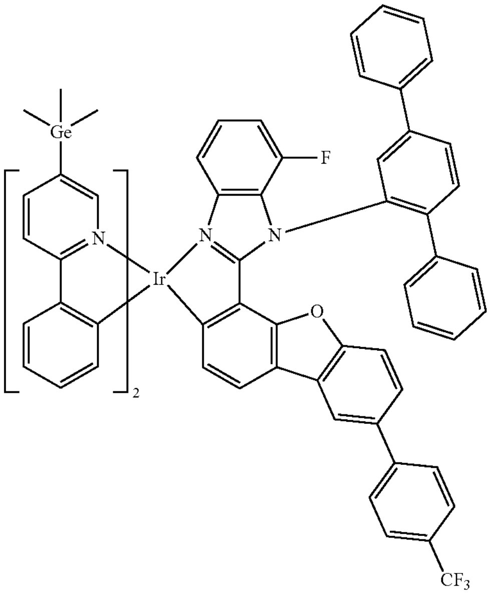
2714
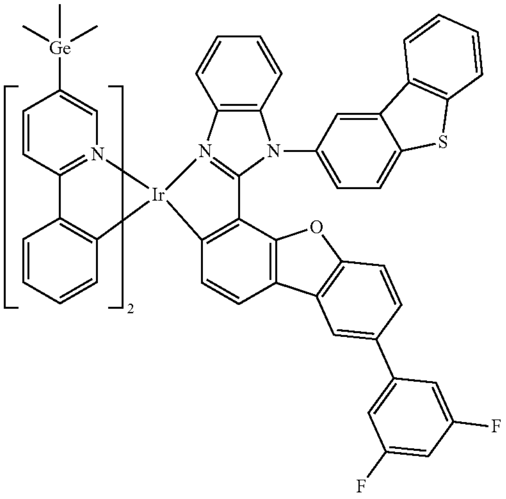
2712
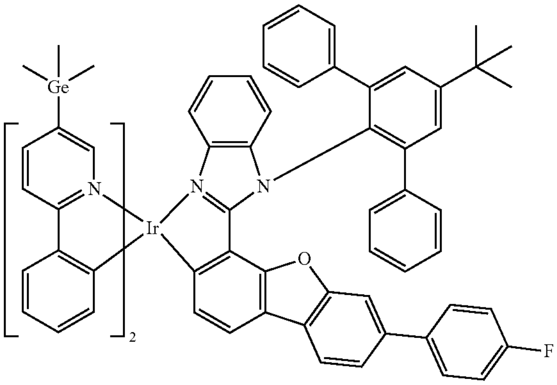
2715
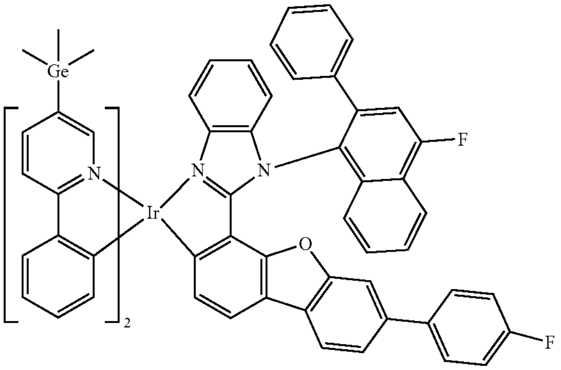

-continued
2716
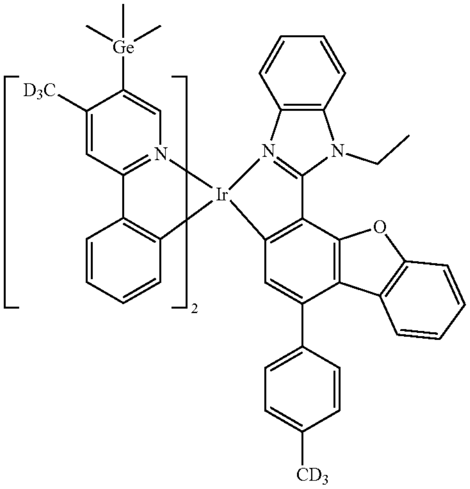
2717
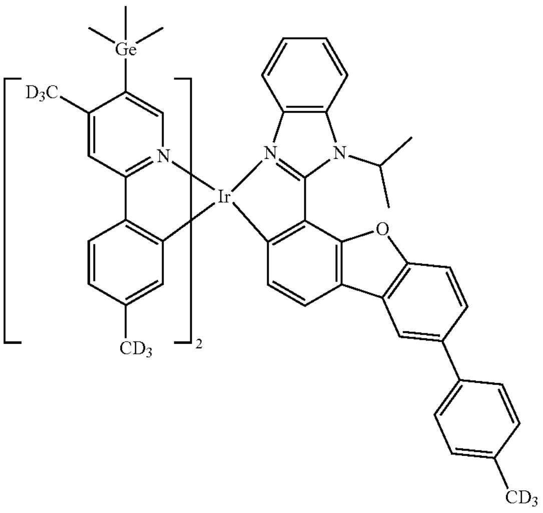
2718
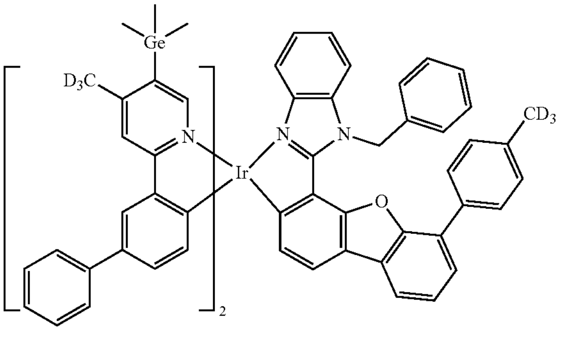
-continued
2719
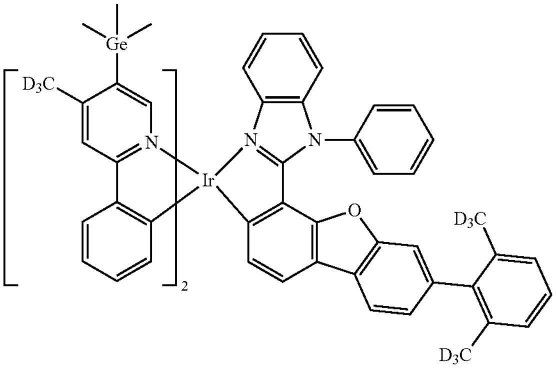
2720
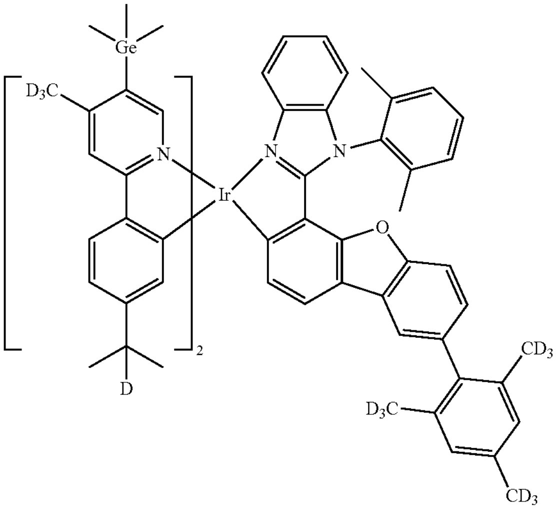
2721
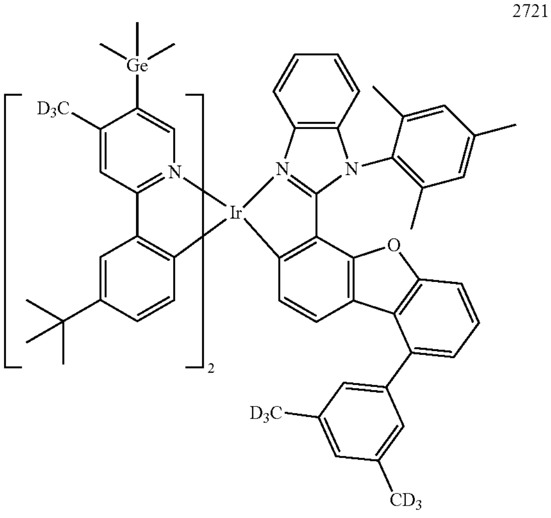

-continued
2722
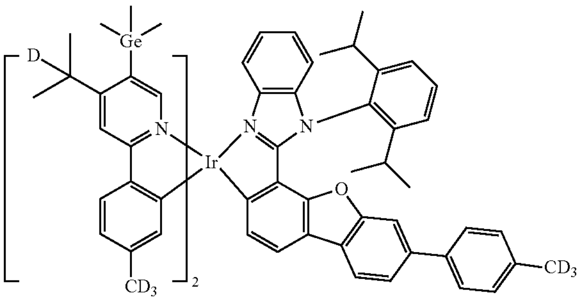
2723
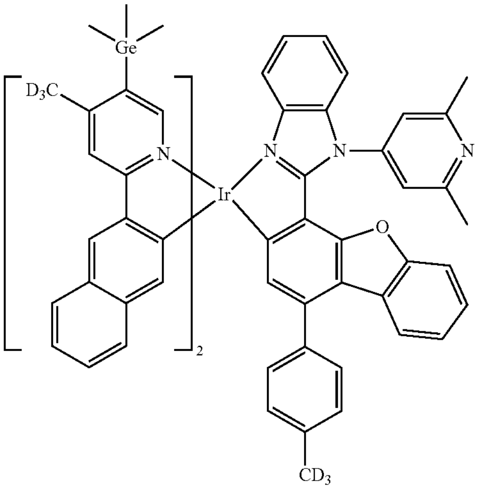
2724
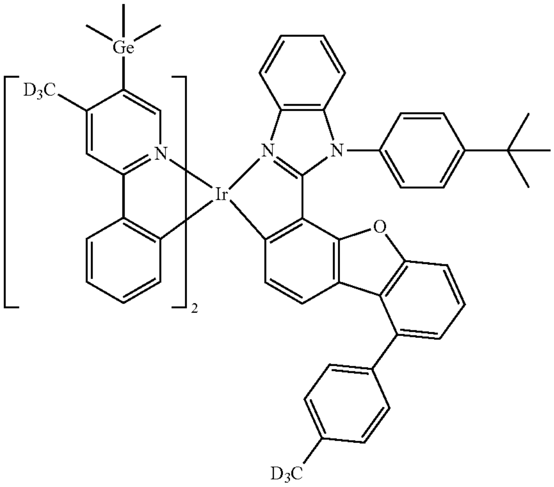
-continued
2725
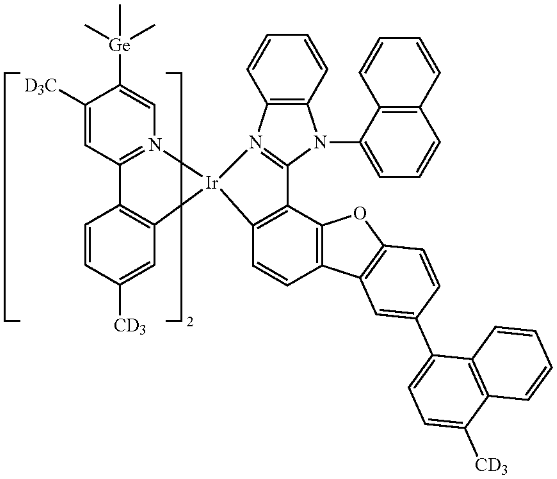
2726
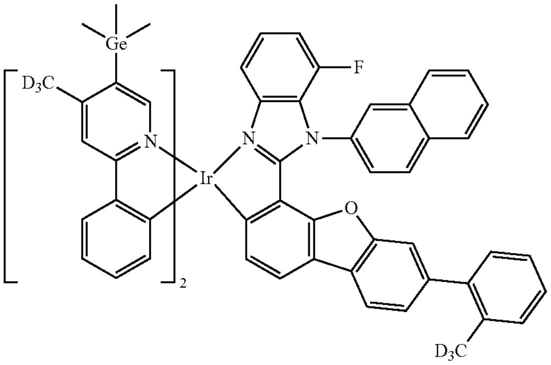
2727
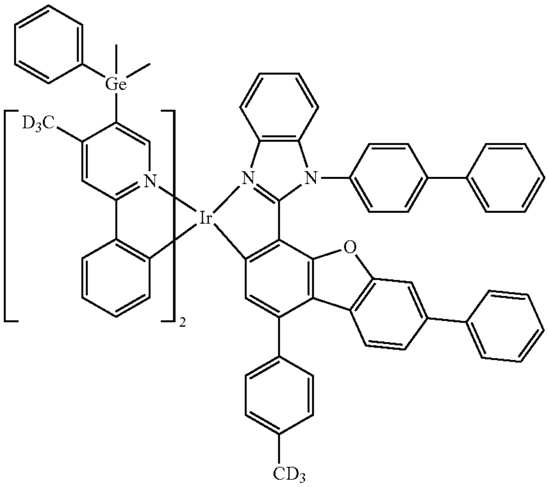

-continued
2728
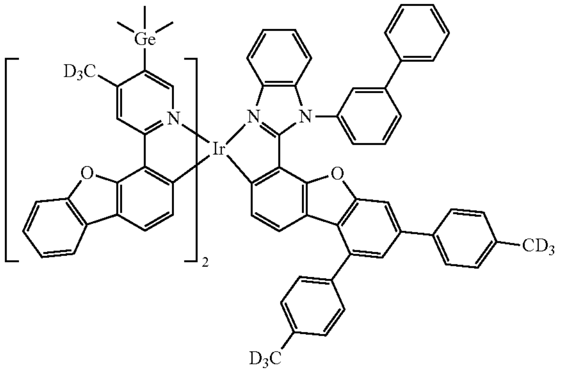
2729
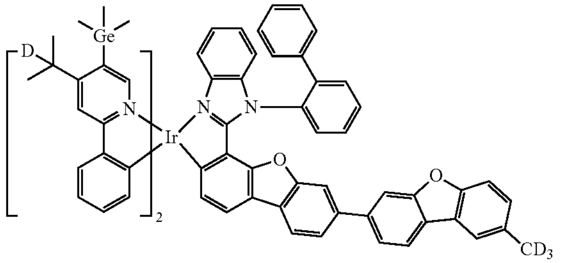
2730
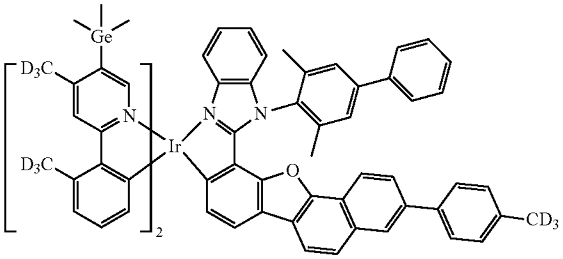
2731
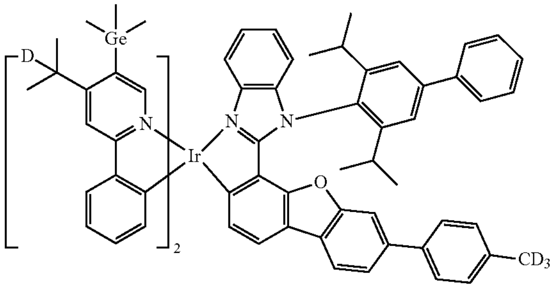
2732
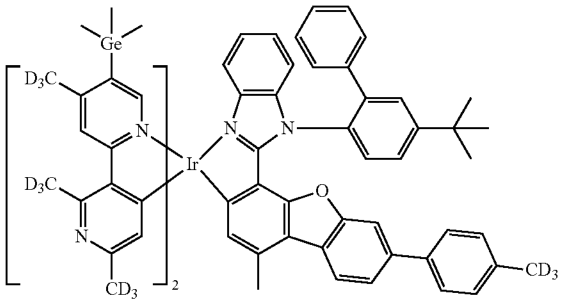
-continued
2733
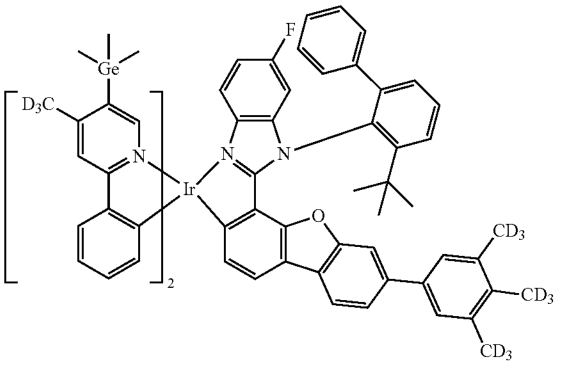
2734
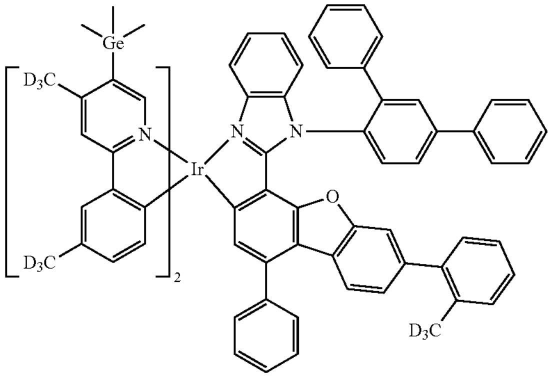
2735
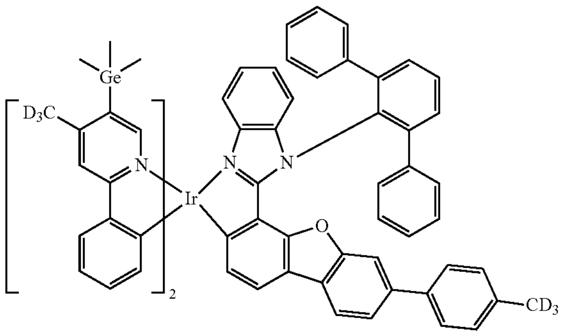

-continued
2736
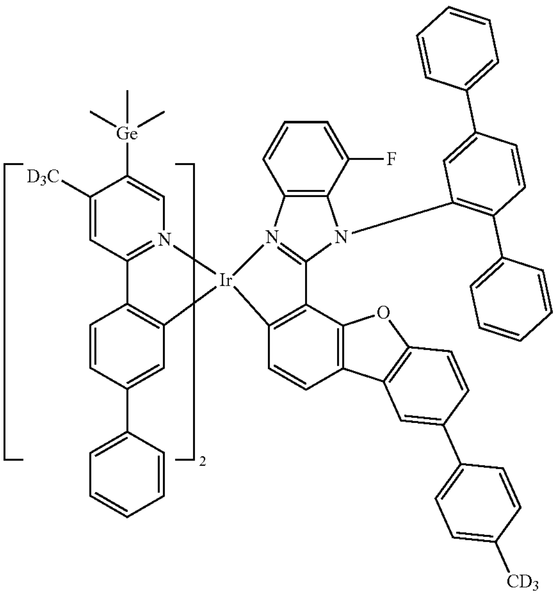
2737
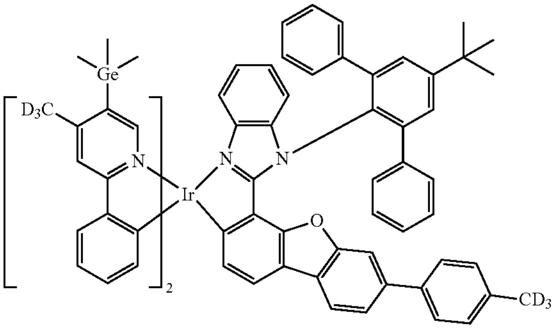
2738
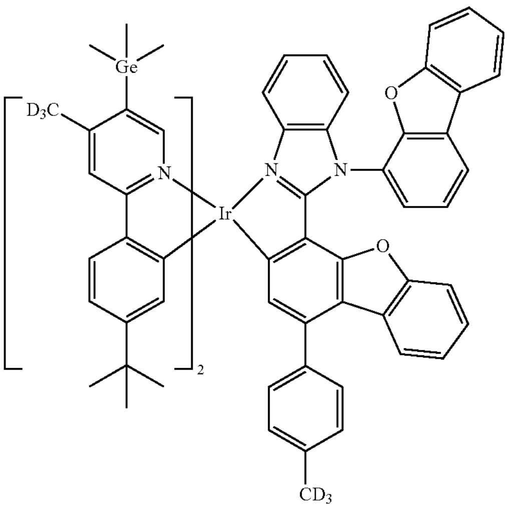
-continued
2739
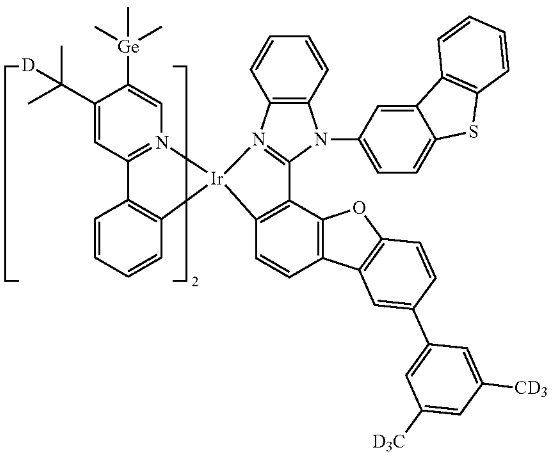
2740
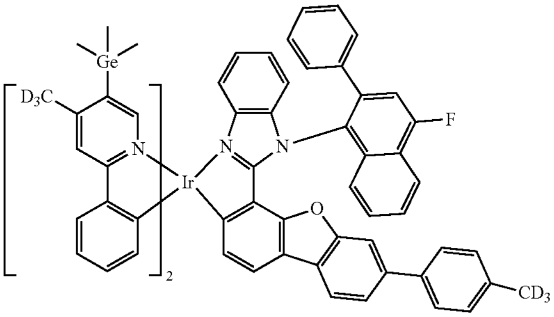
2741
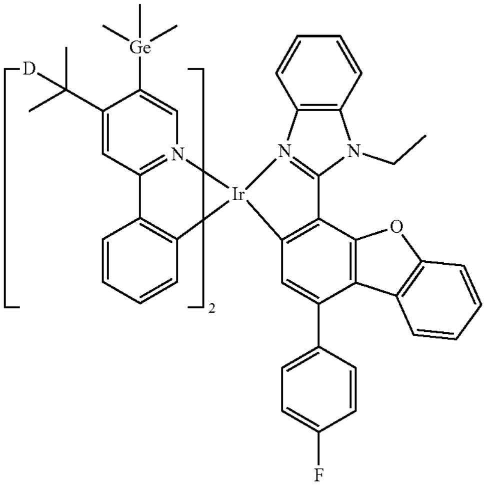

-continued
2742
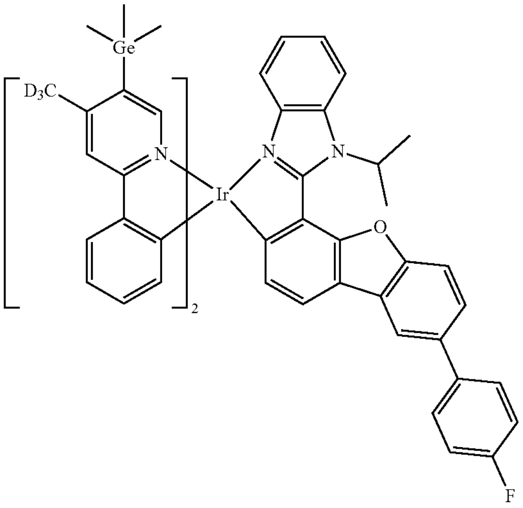
2743
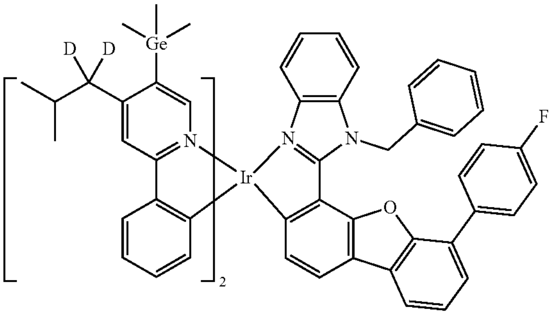
2744
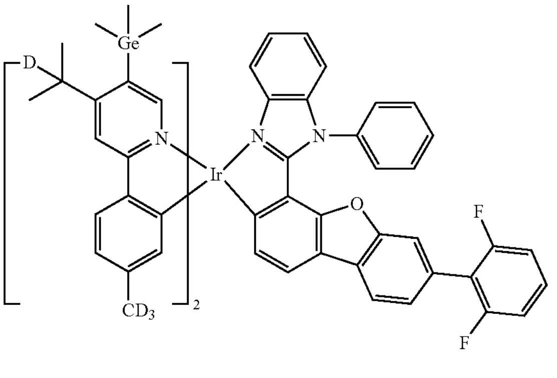
-continued
2745
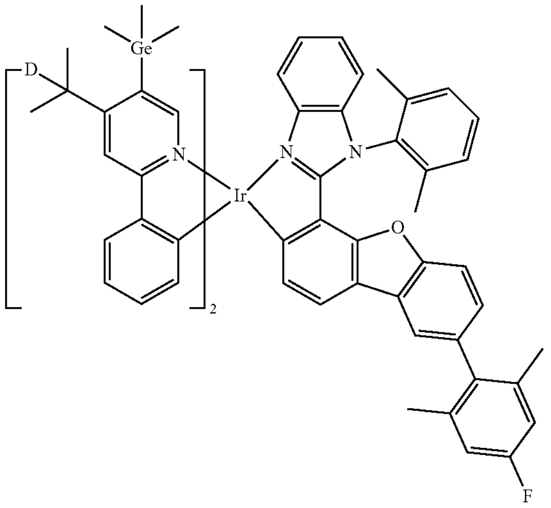
2746
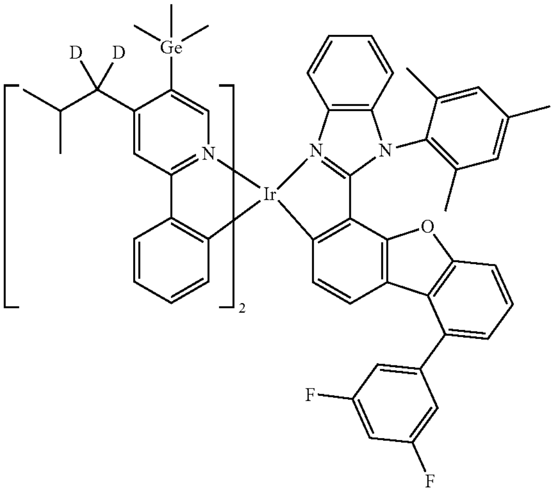
2747
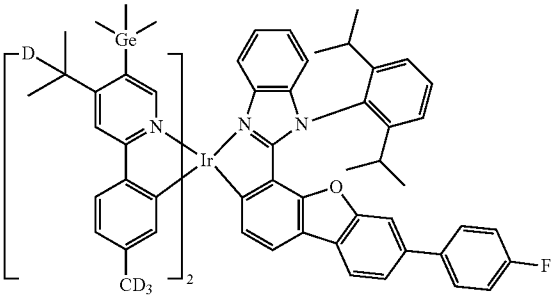

-continued
2748
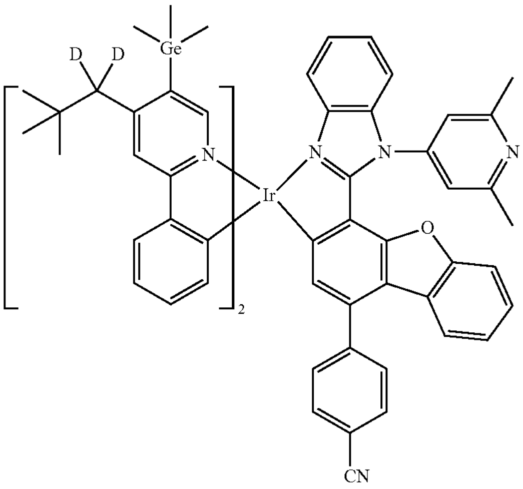
2749
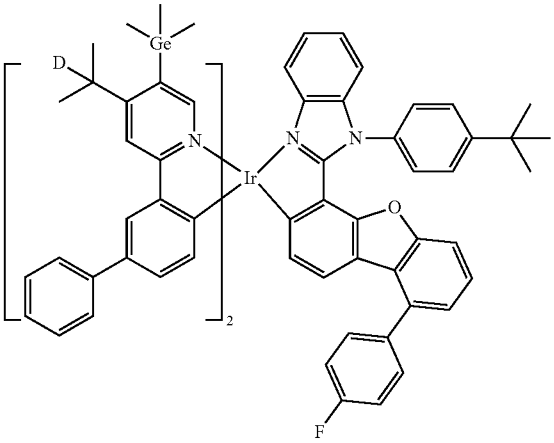
2750
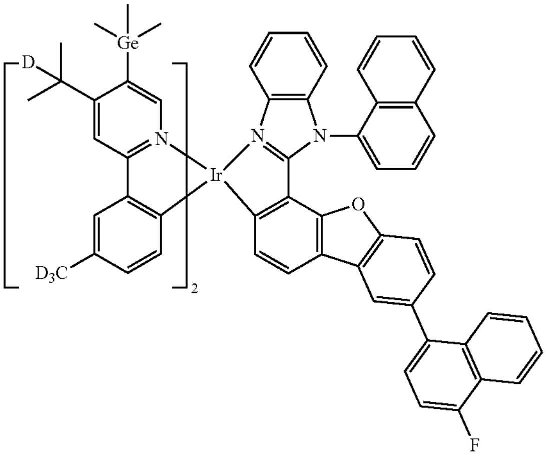
-continued
2751
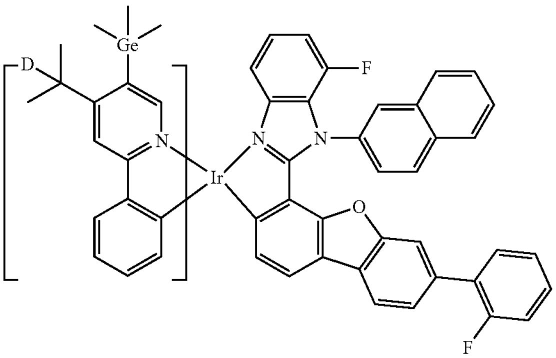
2752
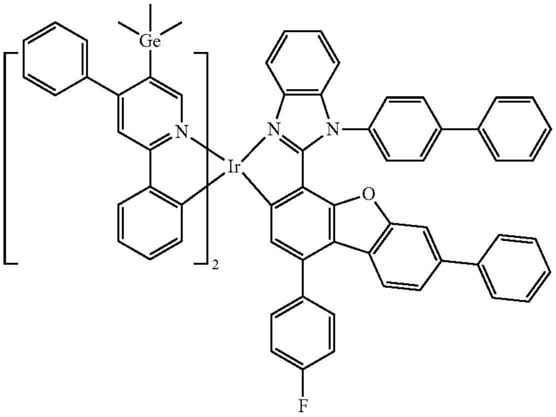
2753
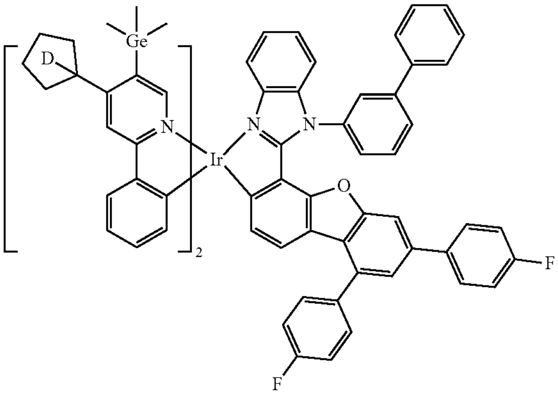
2754
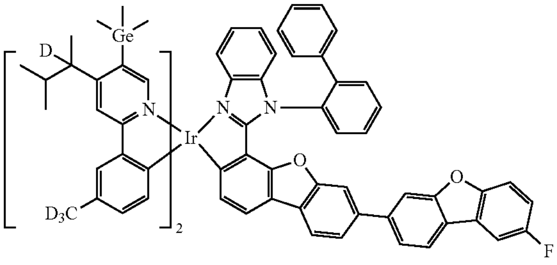

-continued
2755
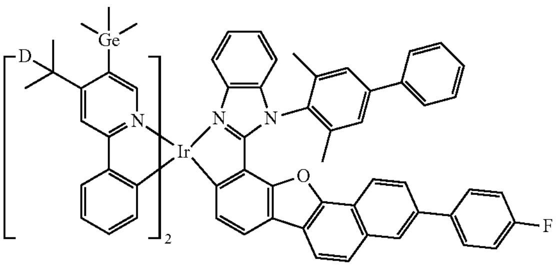
2756
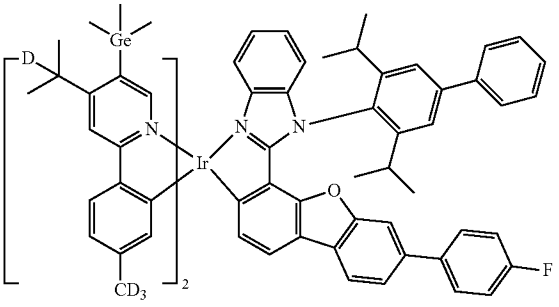
2757
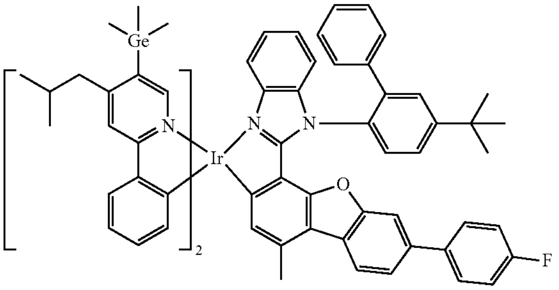
2758
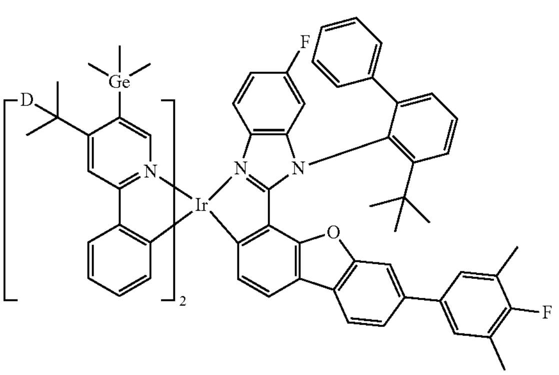
-continued
2759
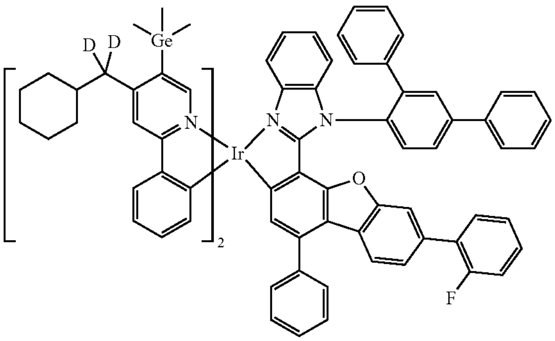
2760
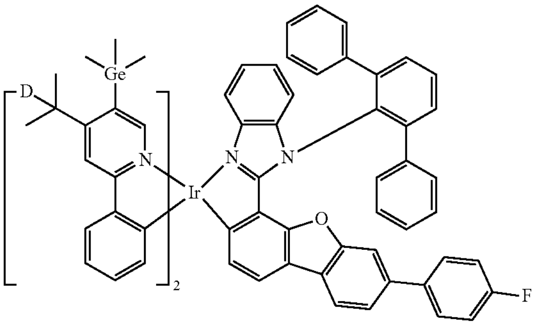
2761
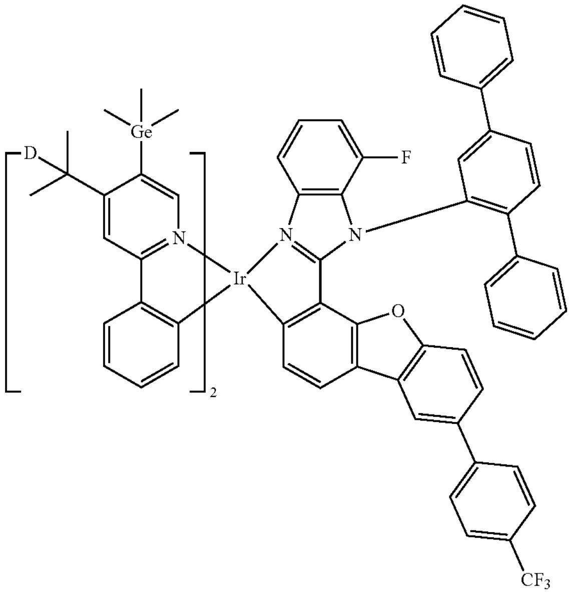

-continued
2762
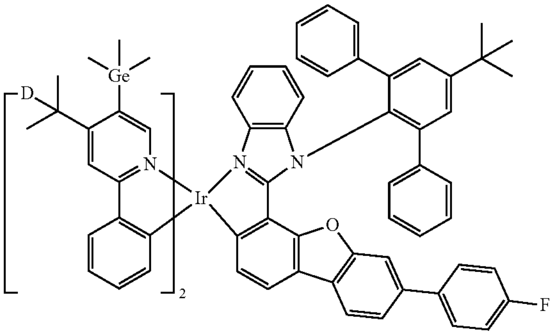
2763
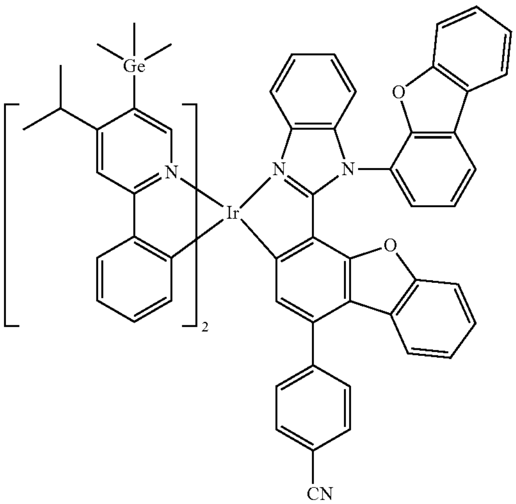
2764
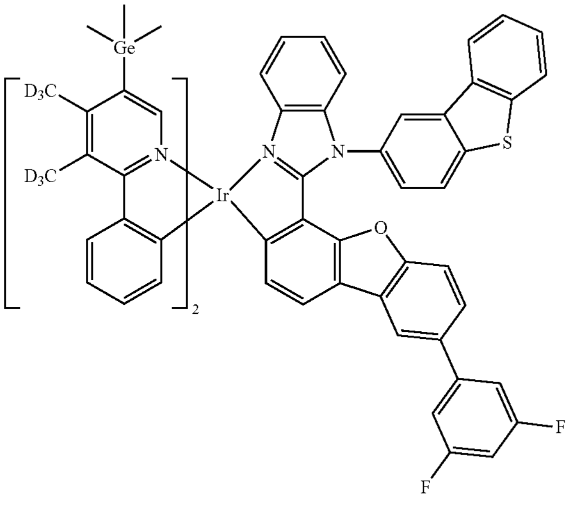
-continued
2765
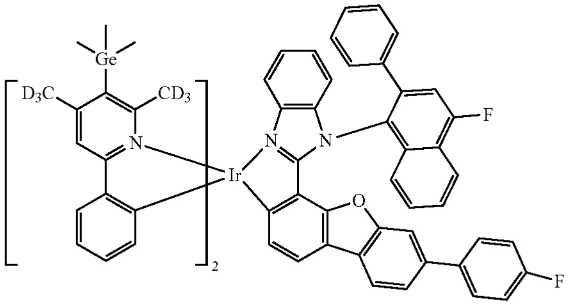
2766
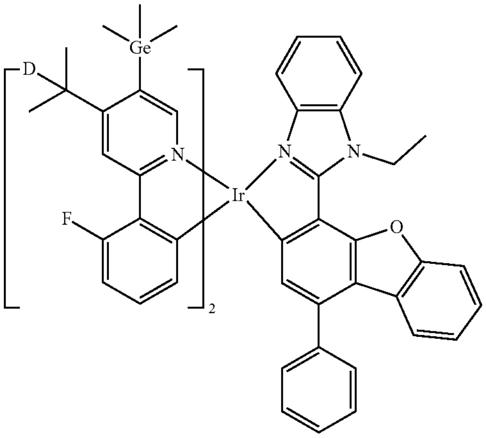
2767
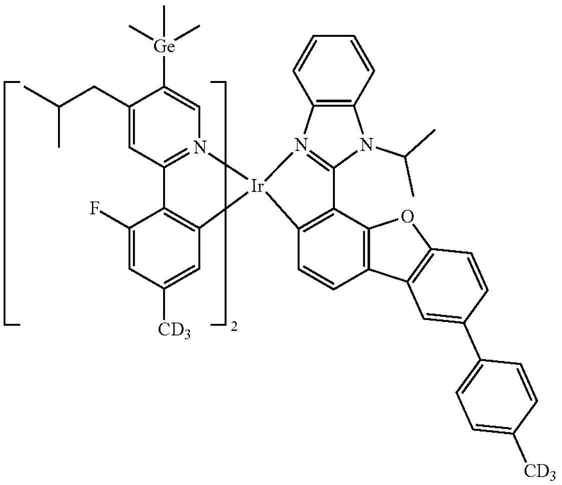
2768
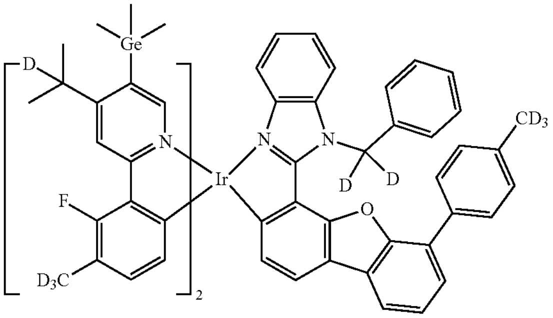

2769
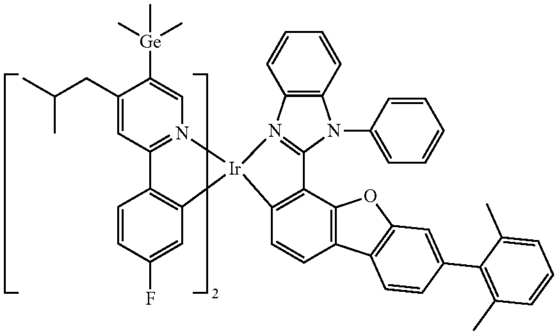
2770
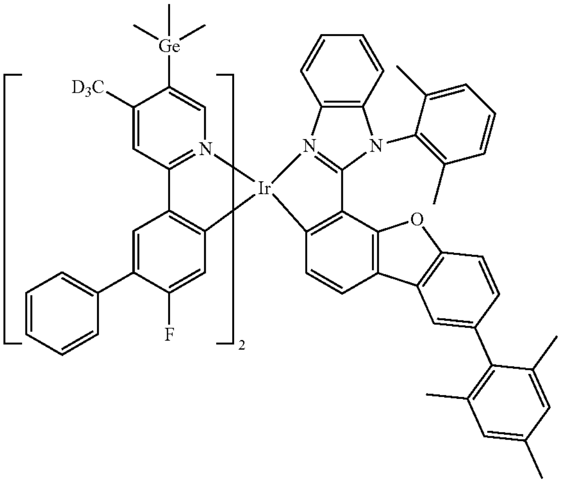
2771
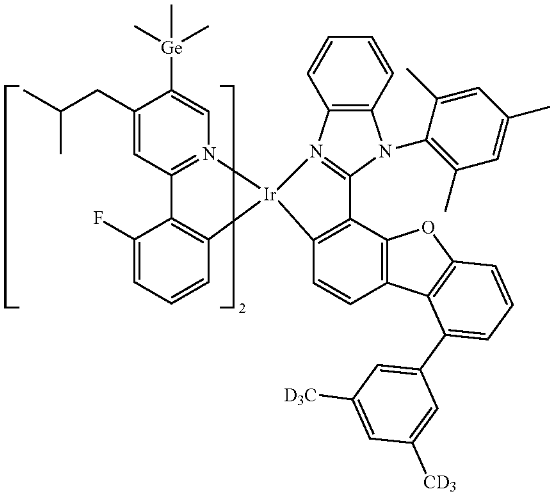
2772
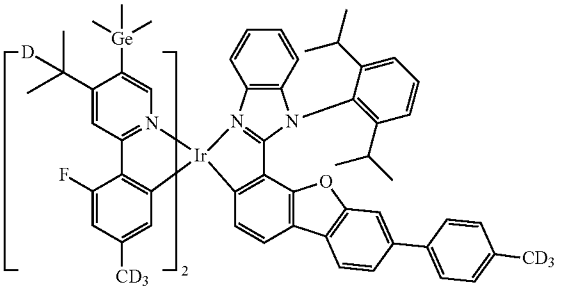
2773
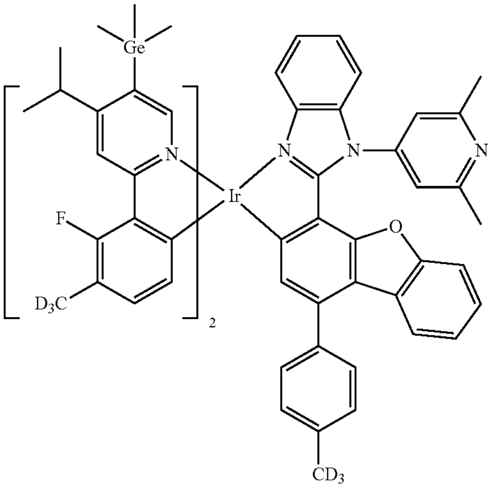
2774
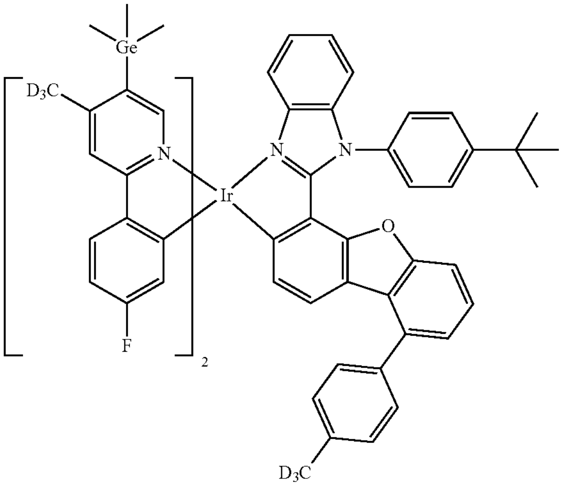

-continued
2775
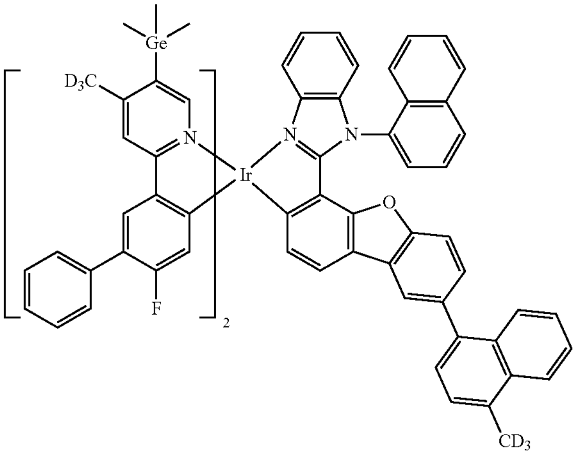
2776
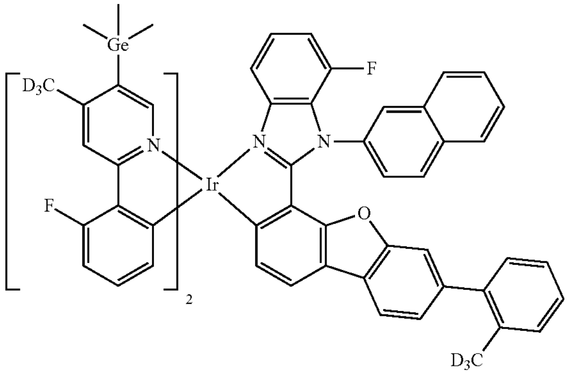
2777
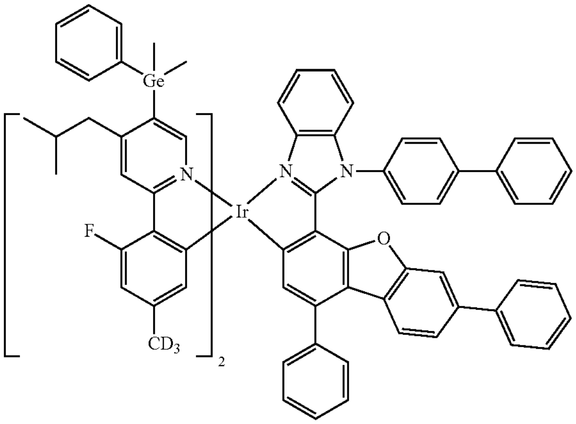
-continued
2778
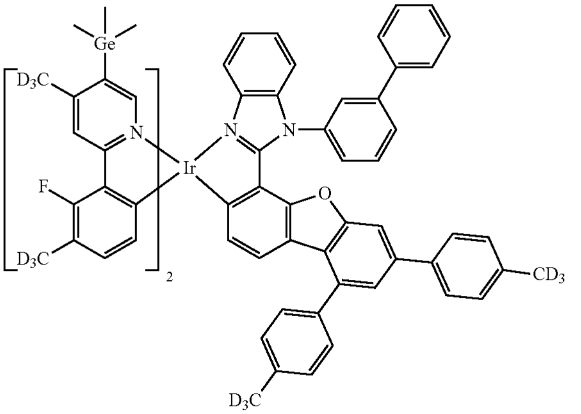
2779
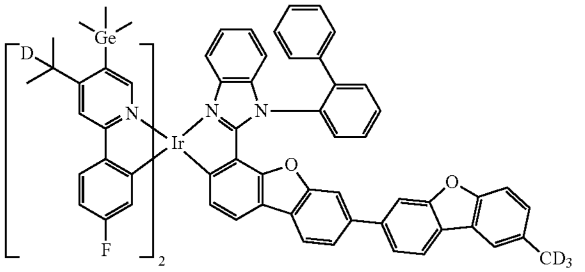
2780
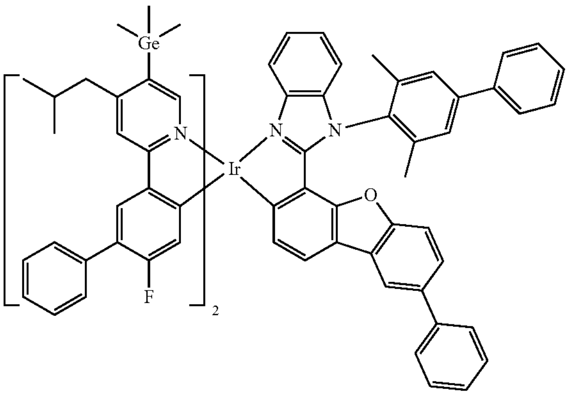
2781
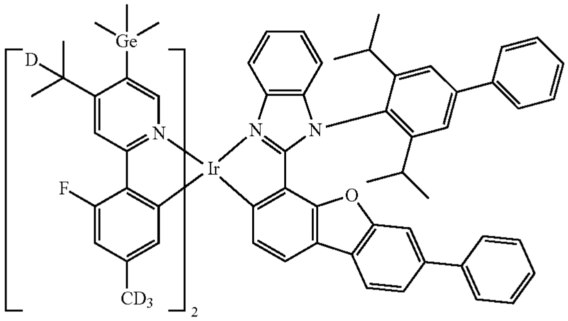

2782
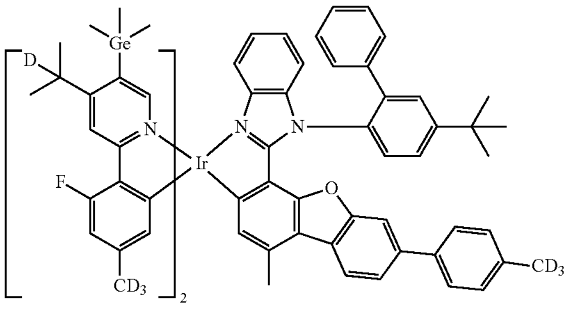
2783
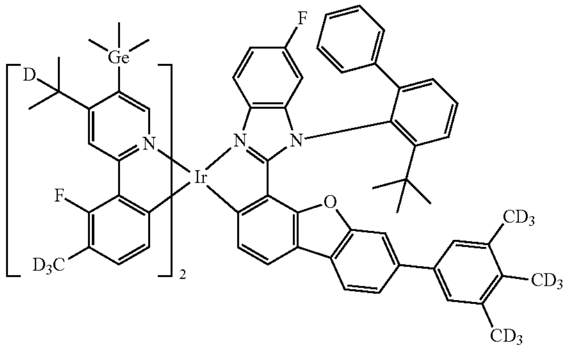
2784
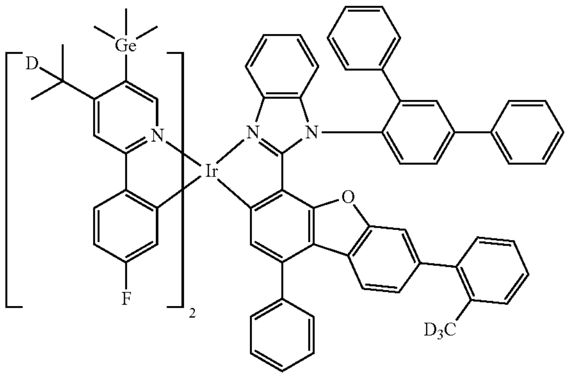
2785
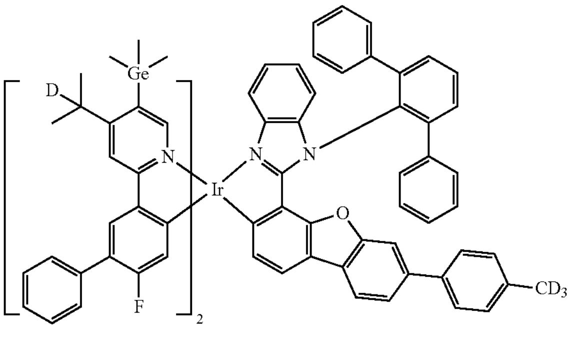
2786
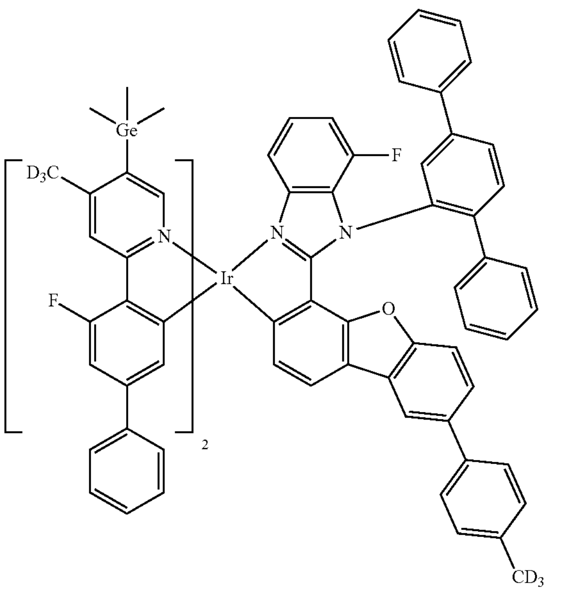
2787
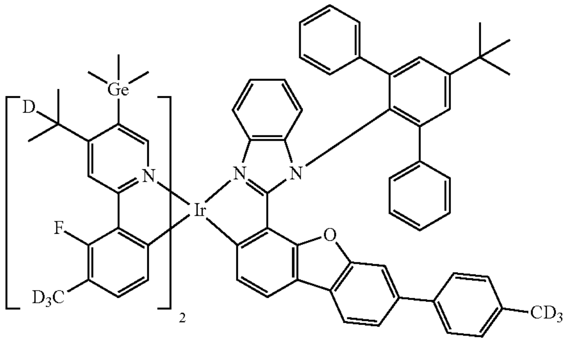
2788
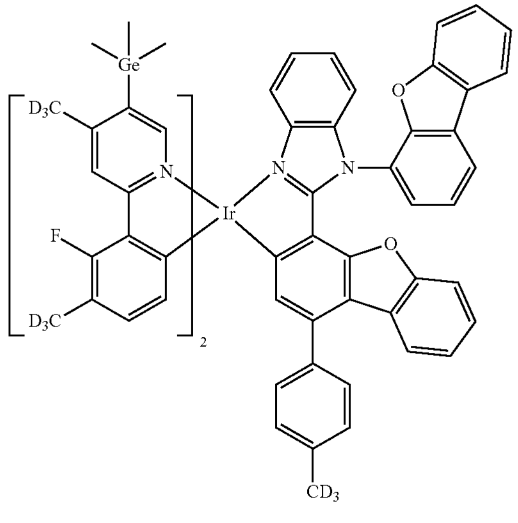

-continued
2789
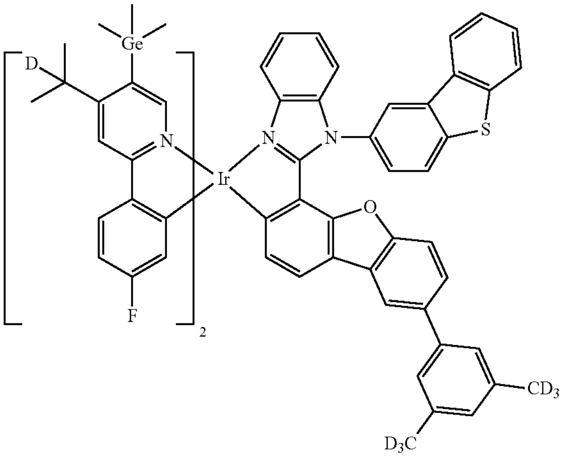
2790
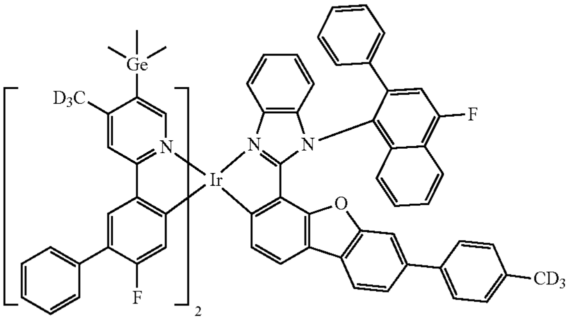
2791
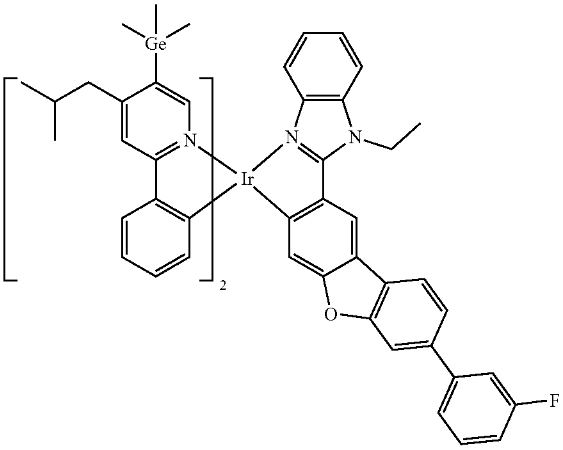
2792
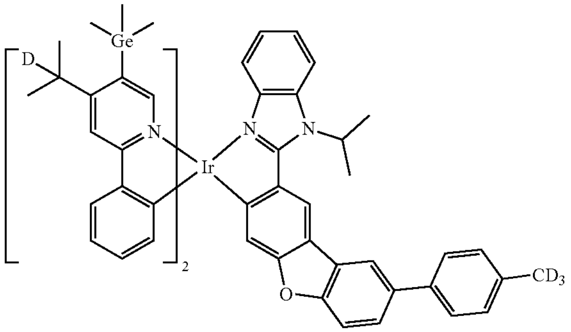
2793
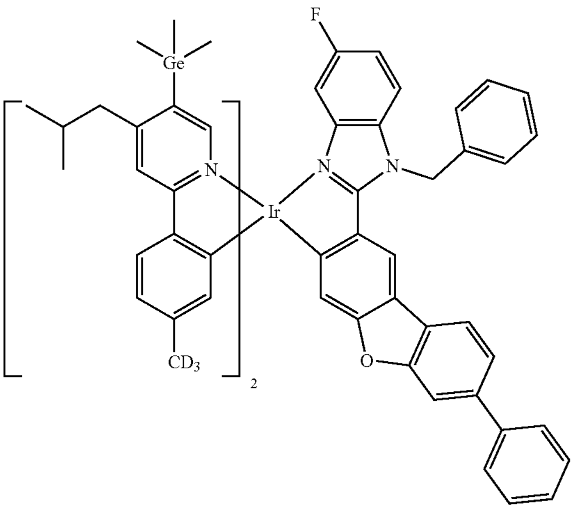
2794
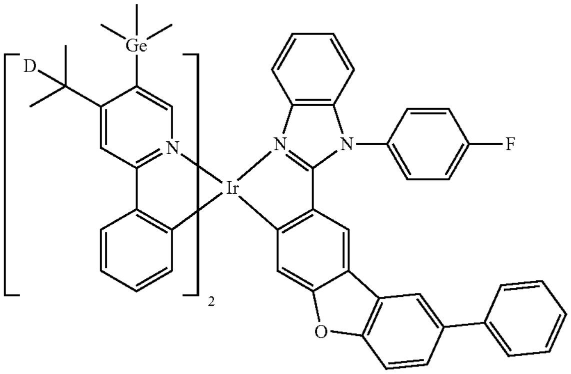
2795
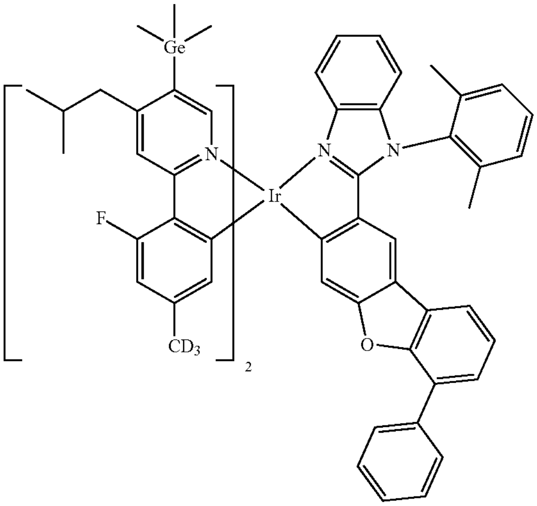

-continued
2796
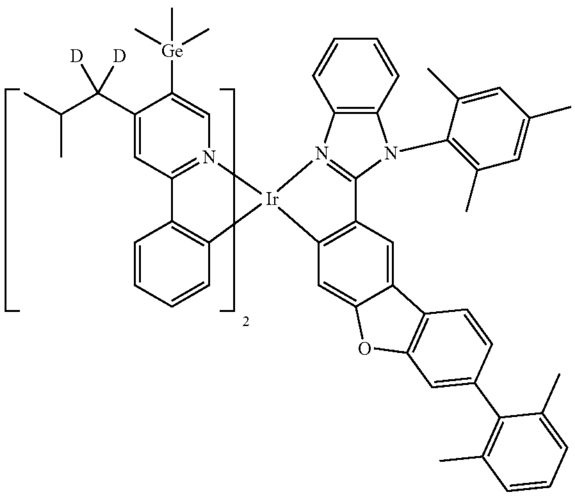
2797
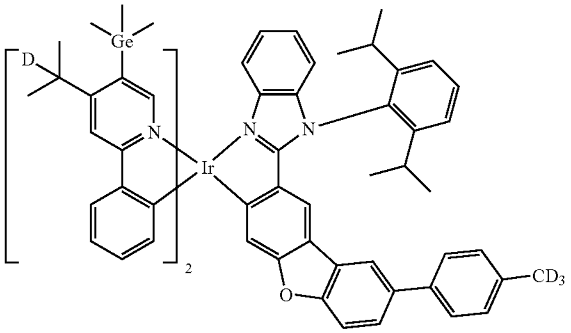
2798
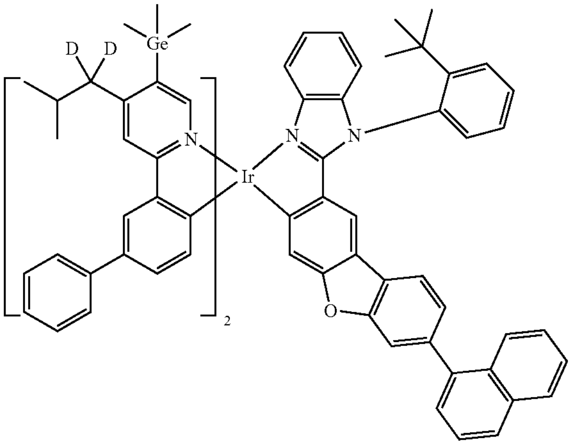
-continued
2799
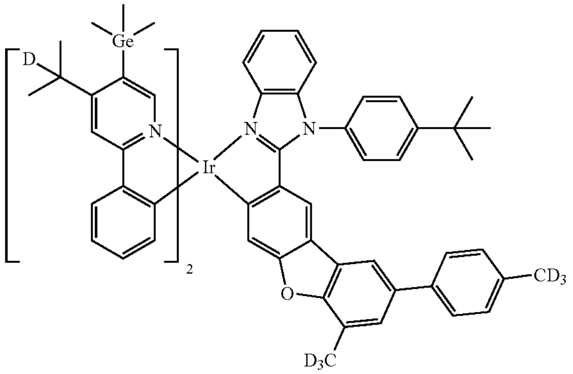
2800
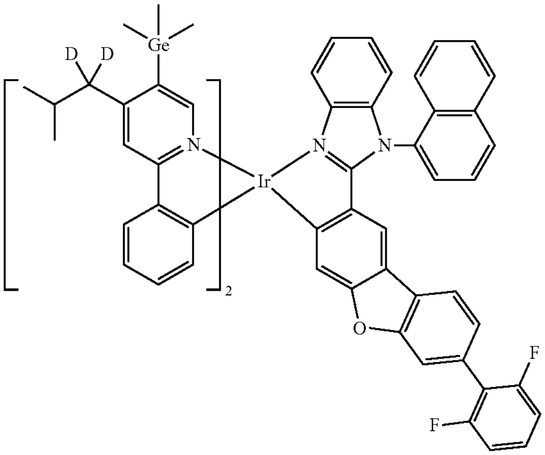
2801
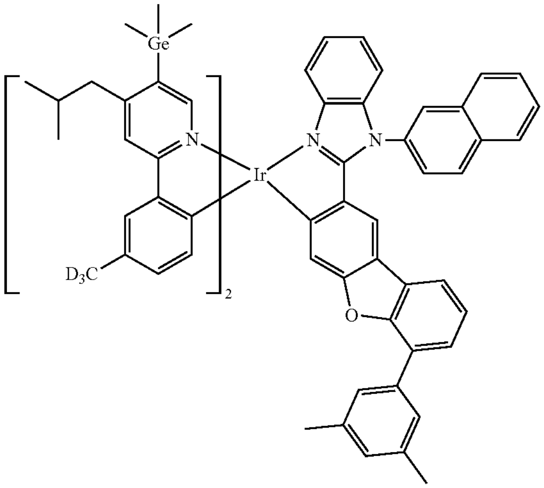

-continued
2802
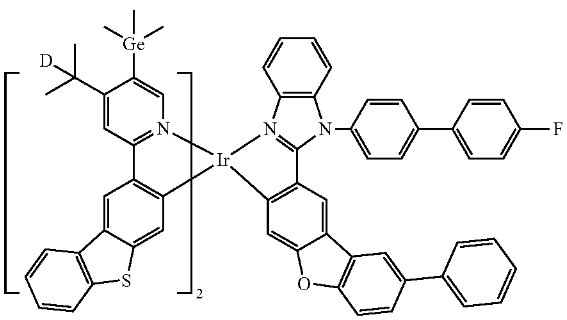
2803
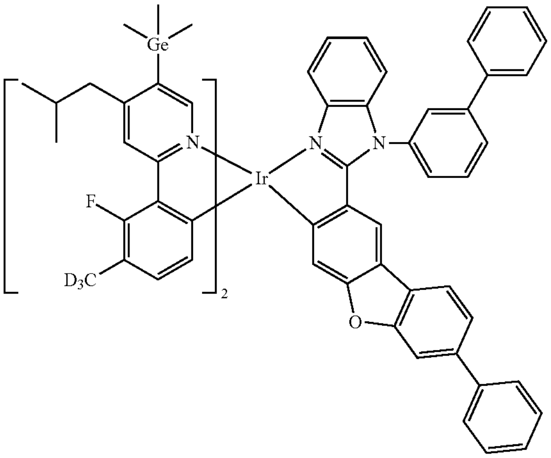
2804
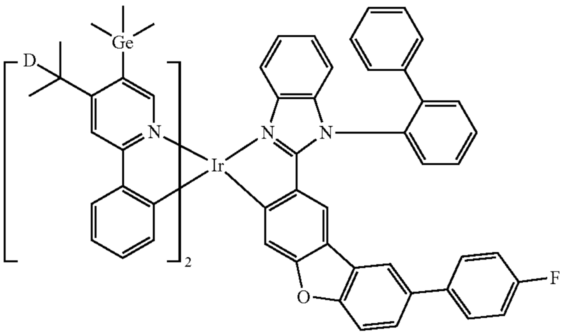
2805
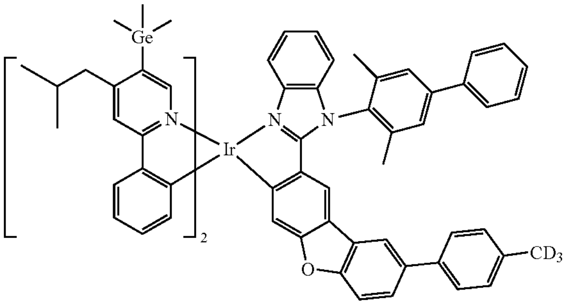
-continued
2806
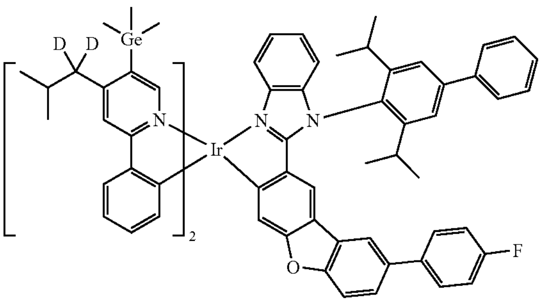
2807
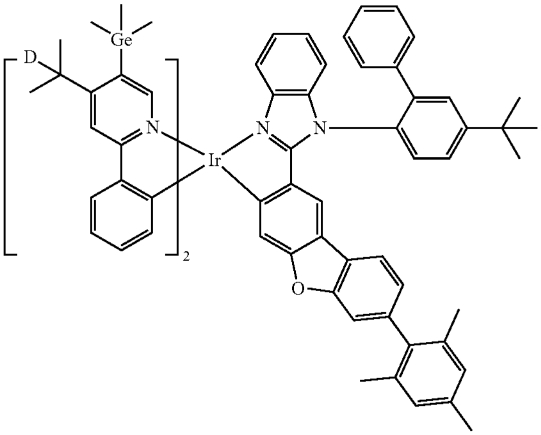
2808
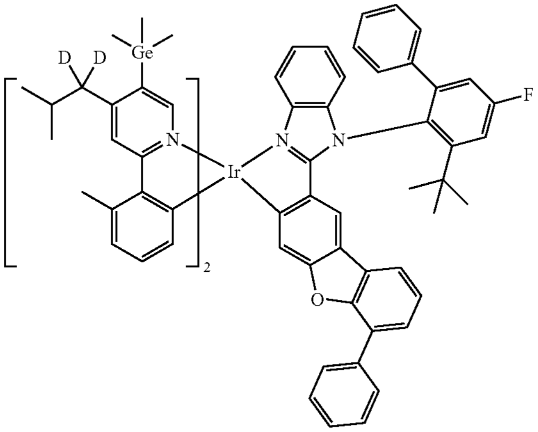

-continued
2809
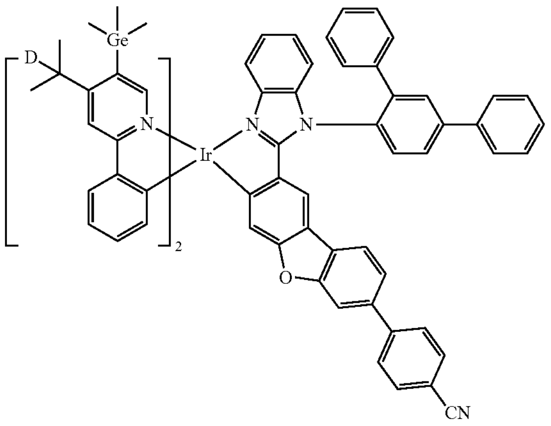
2810
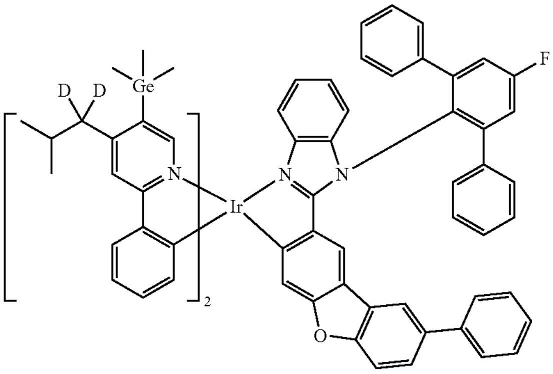
2811
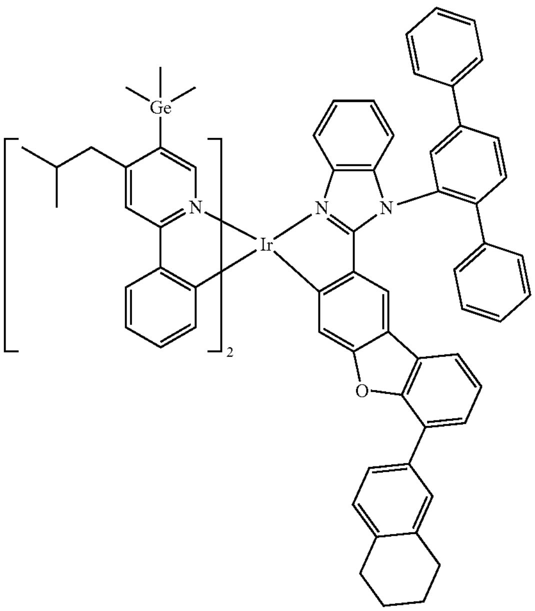
-continued
2812
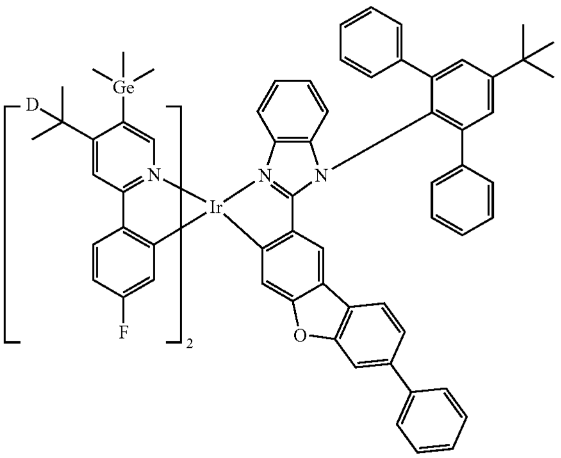
2813
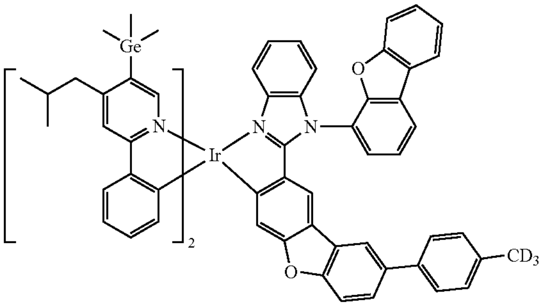
2814
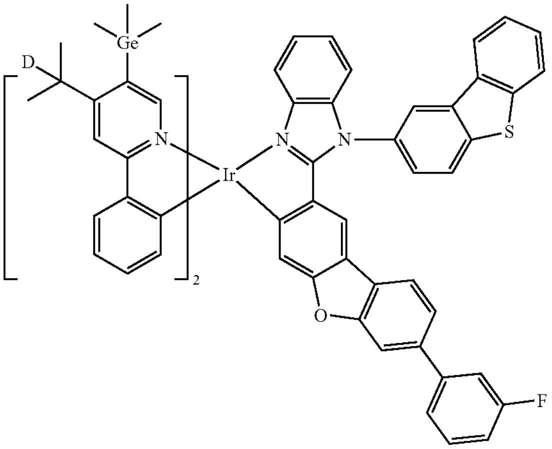

-continued
2815
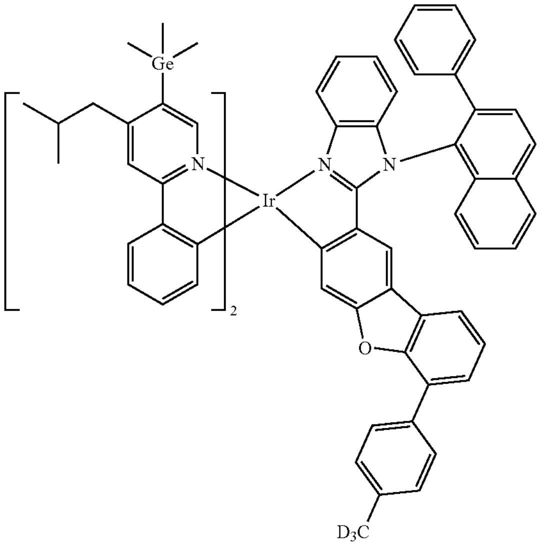
2816
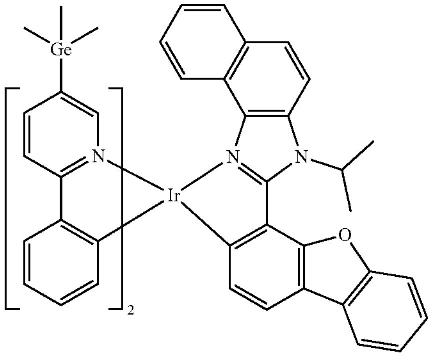
2817
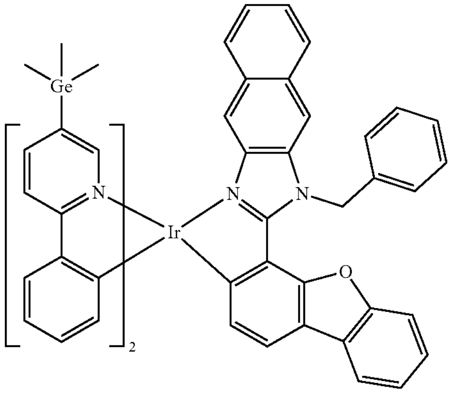
-continued
2818
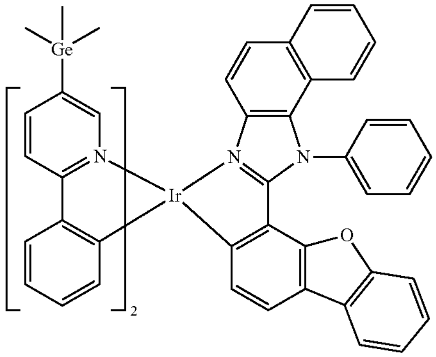
2819
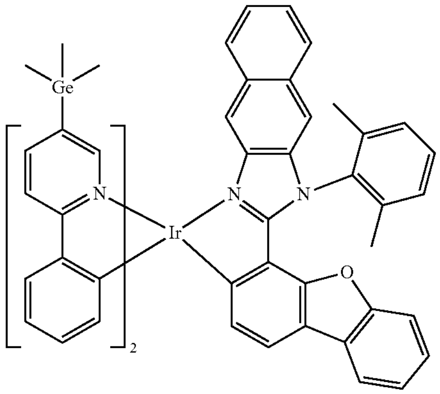
2820
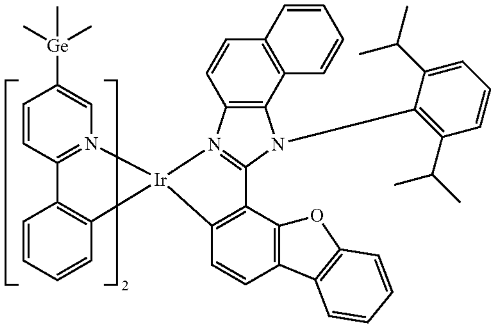
2821
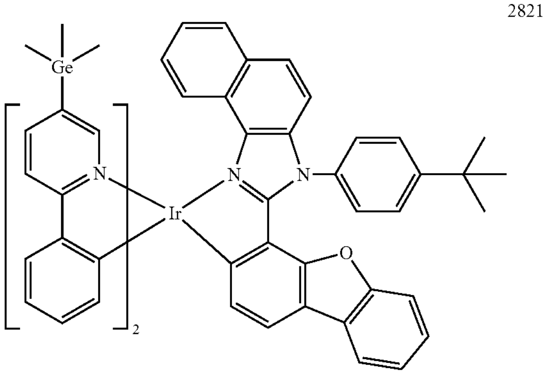

-continued
2822
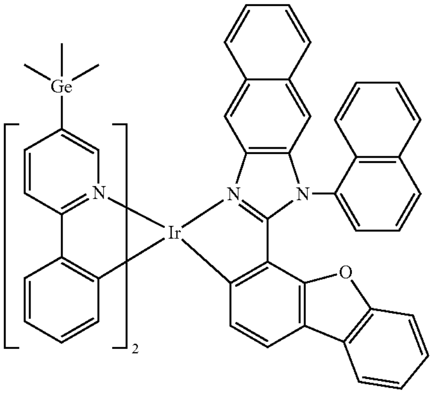
2823
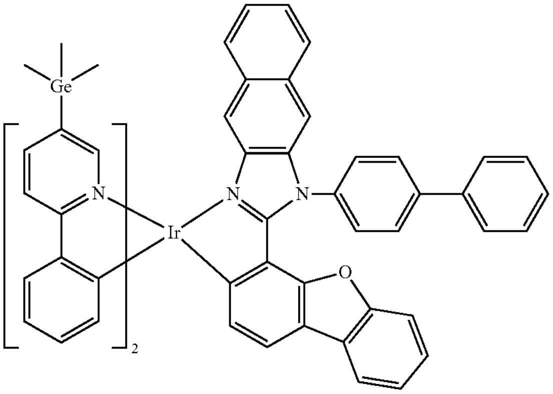
2824
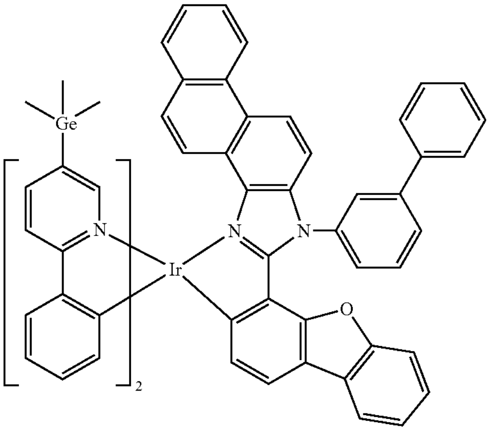
2825
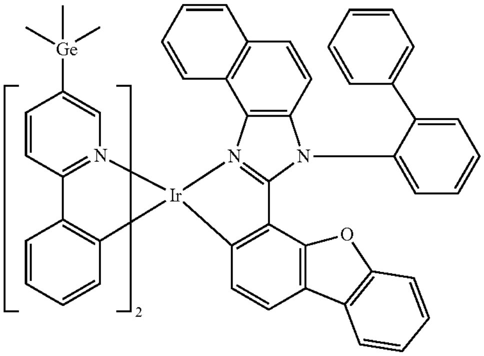
-continued
2826
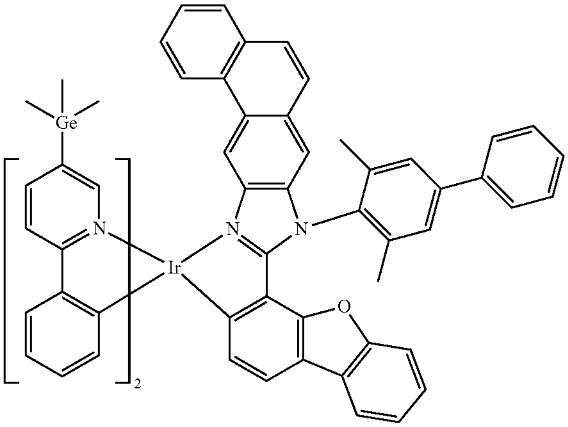
2827
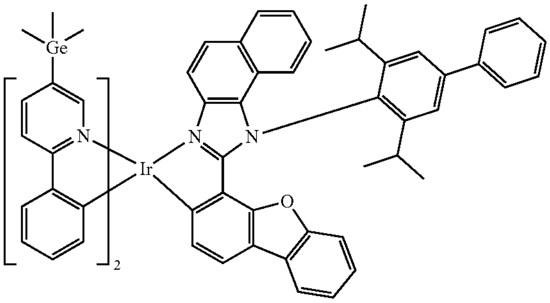
2828
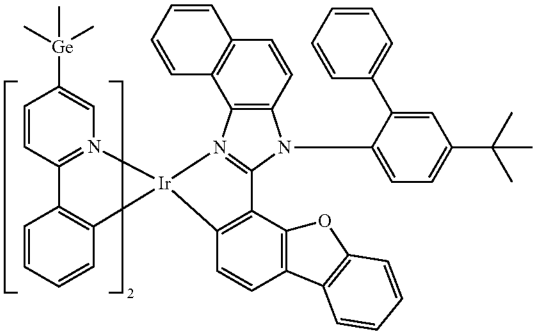
2829
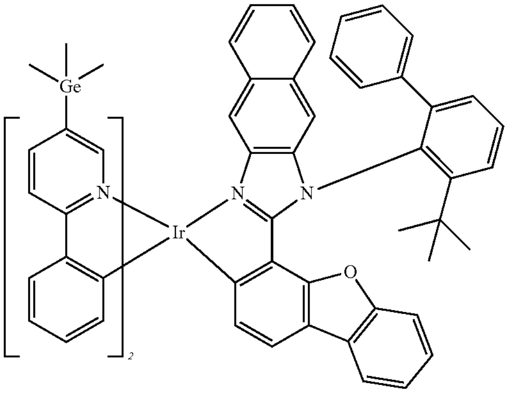

-continued
2830
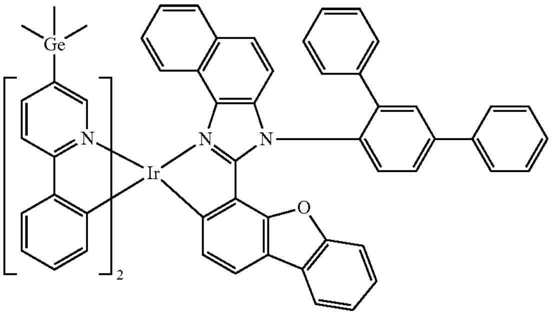
2831
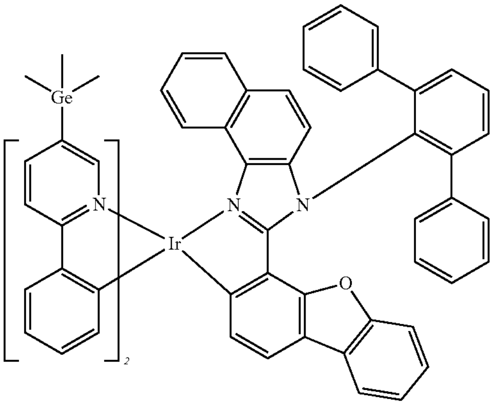
2832
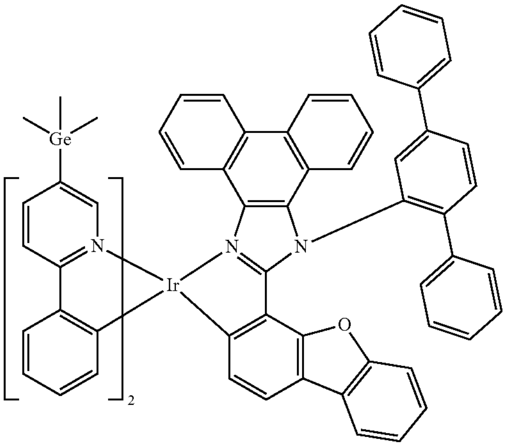
2833
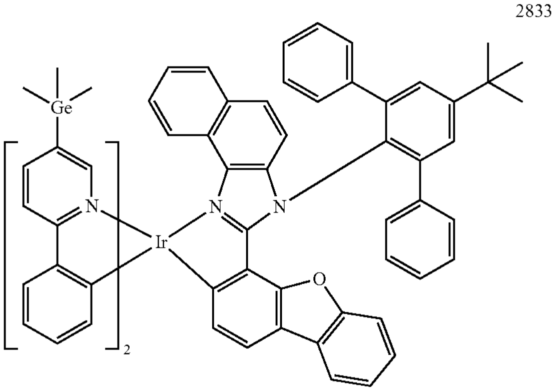
-continued
2834
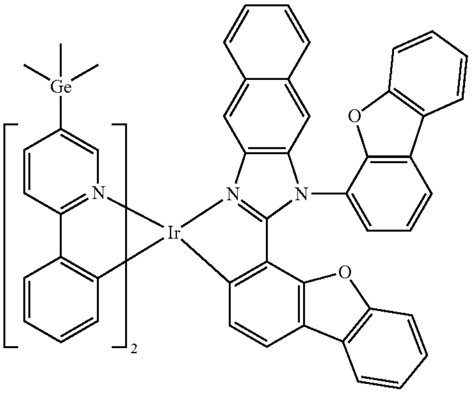
2835
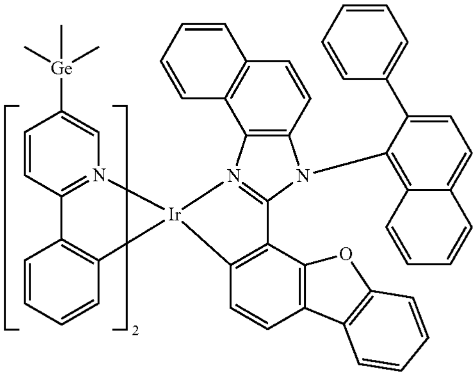
2836
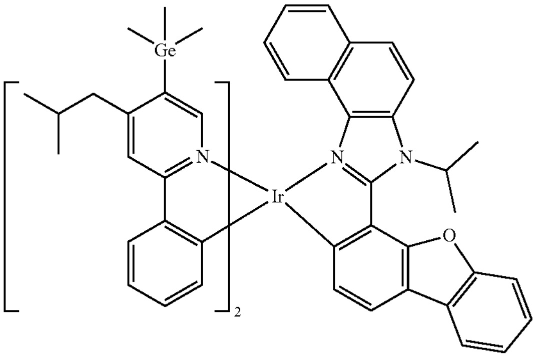
2837
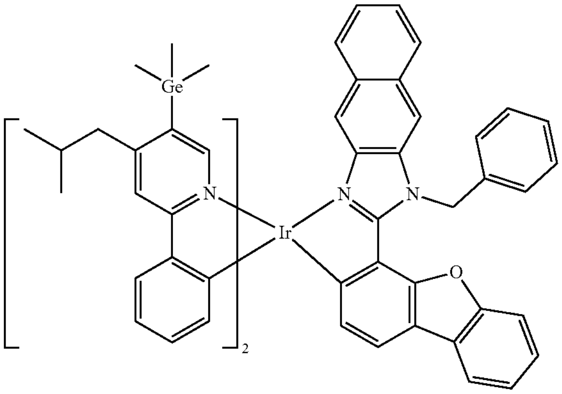

-continued
2838
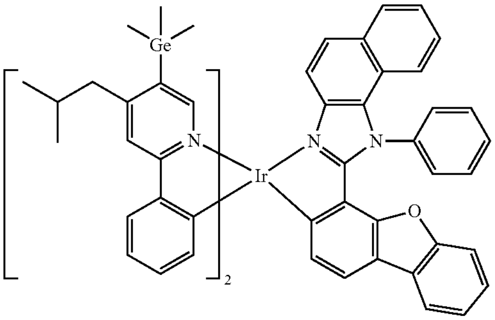
2839
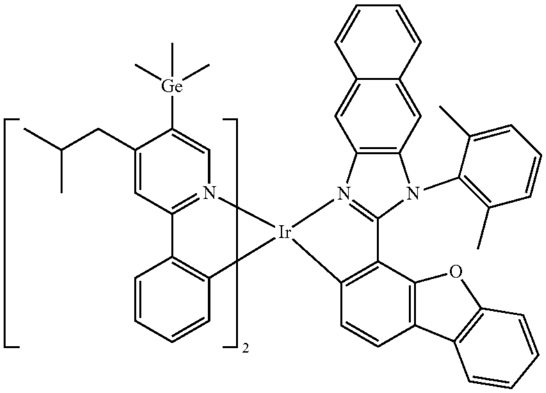
2840
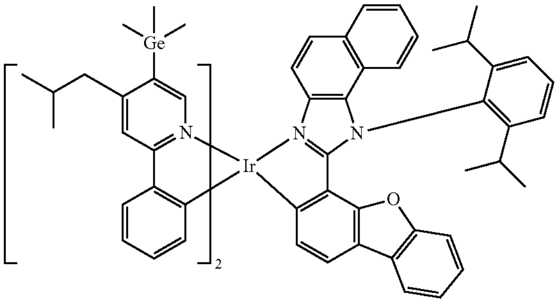
2841
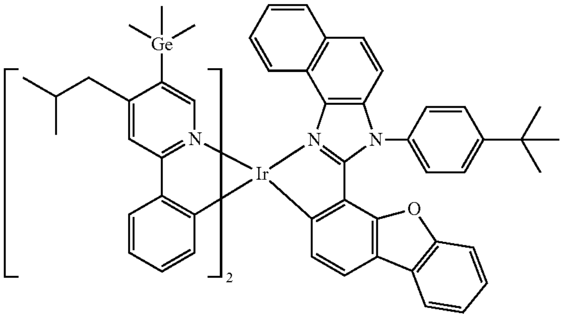
-continued
2842
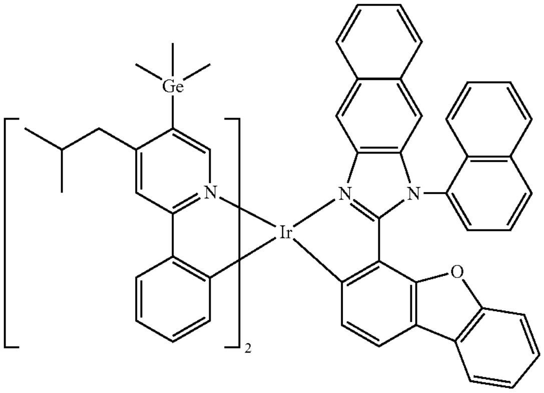
2843
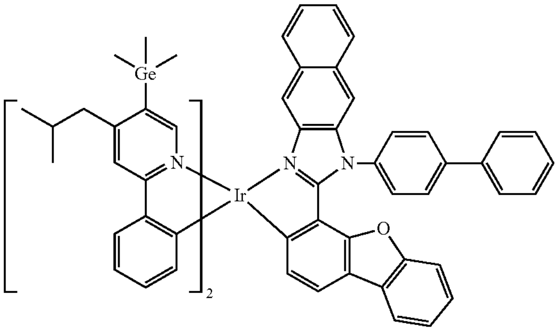
2844
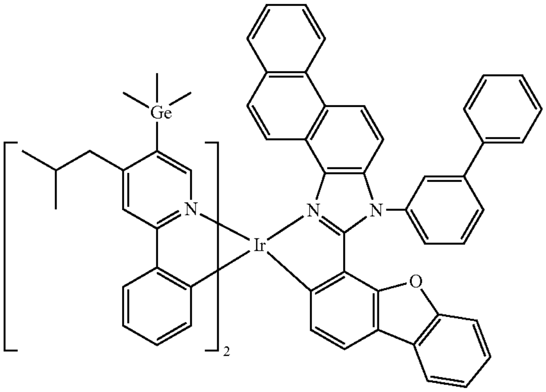
2845
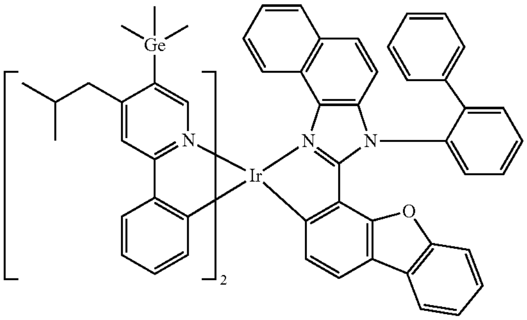

-continued
2846
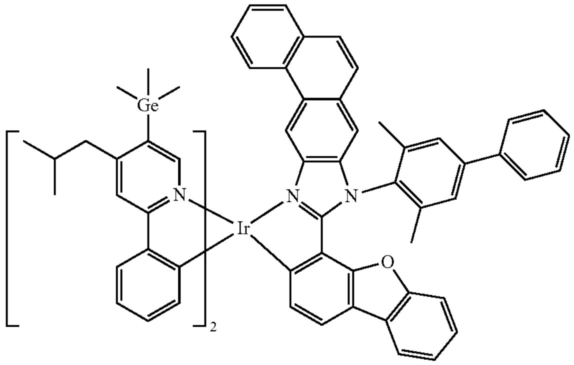
2847
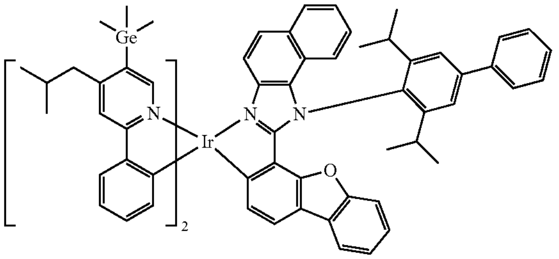
2848
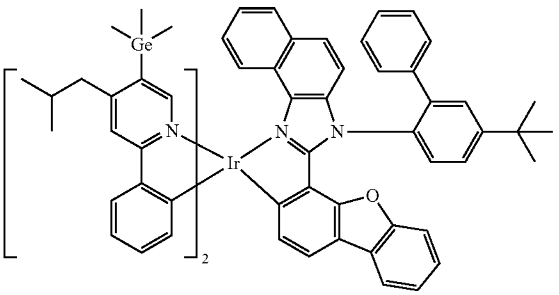
2849
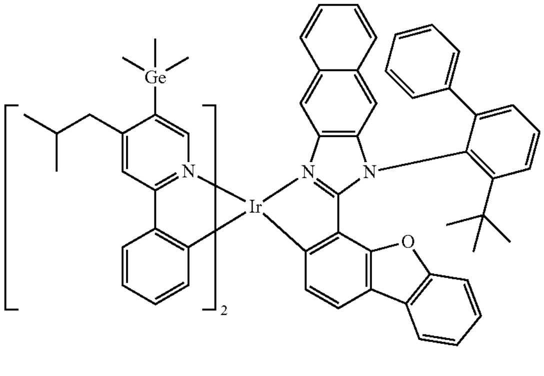
-continued
2850
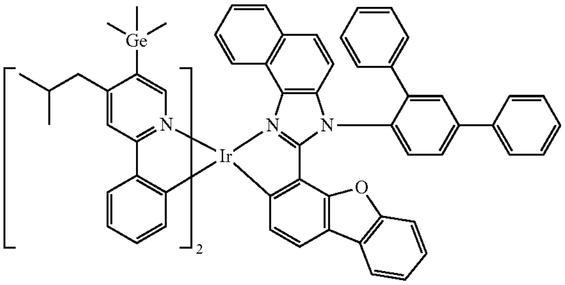
2851
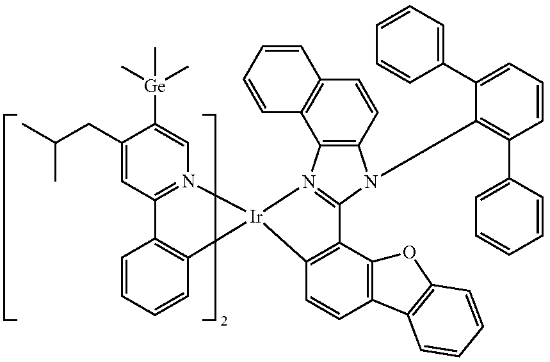
2852
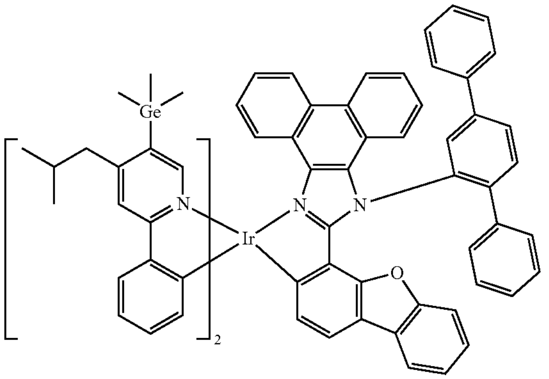
2853
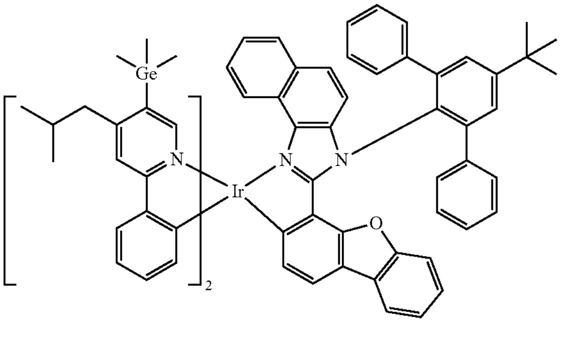

-continued
2854
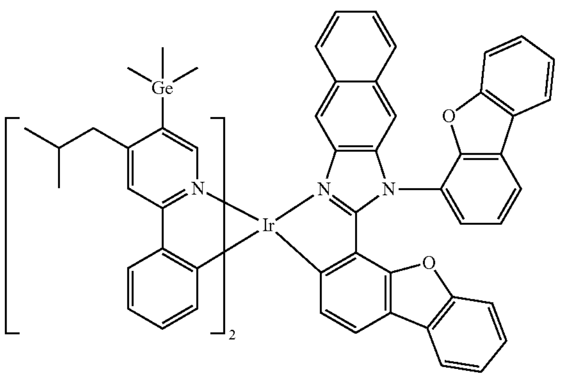
2855
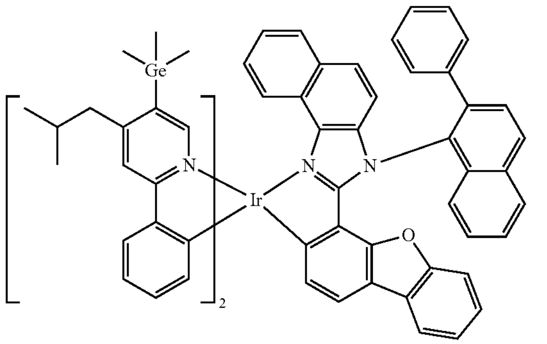
2856
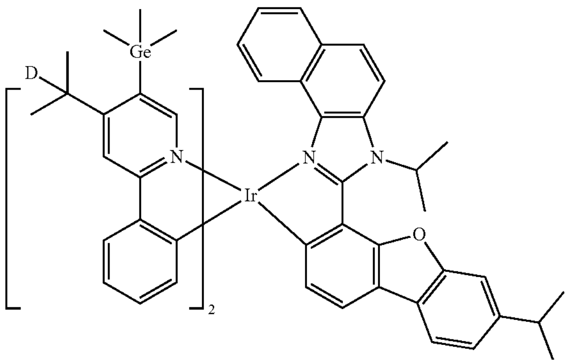
2857
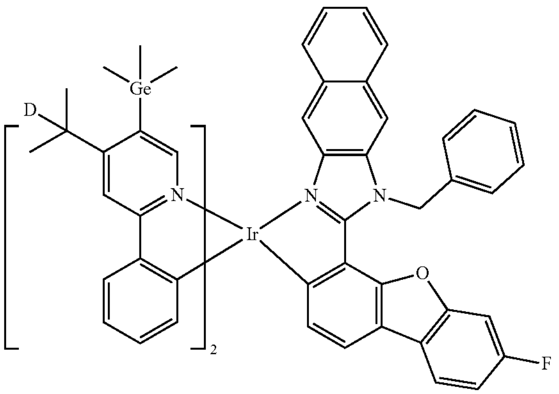
-continued
2858
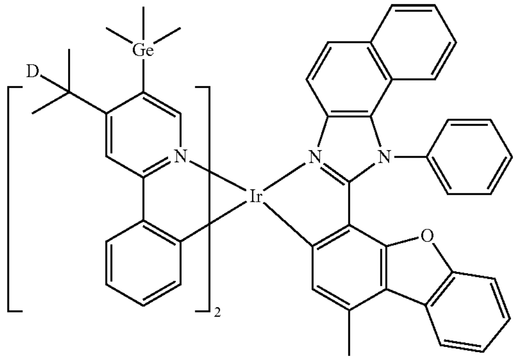
2859
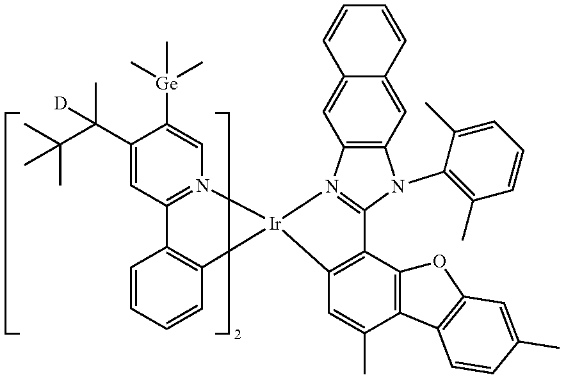
2860
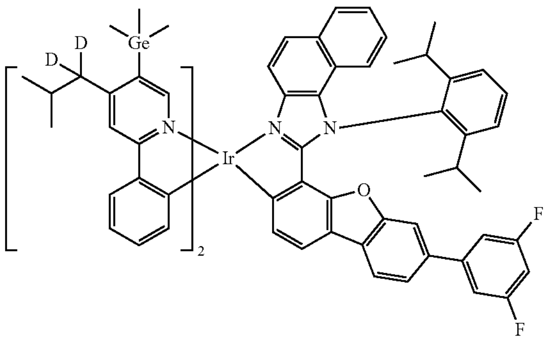
2861
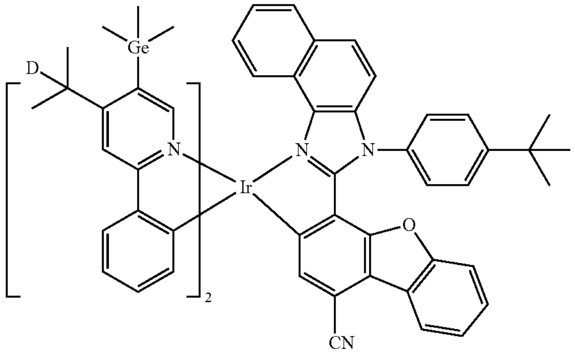

-continued
2862
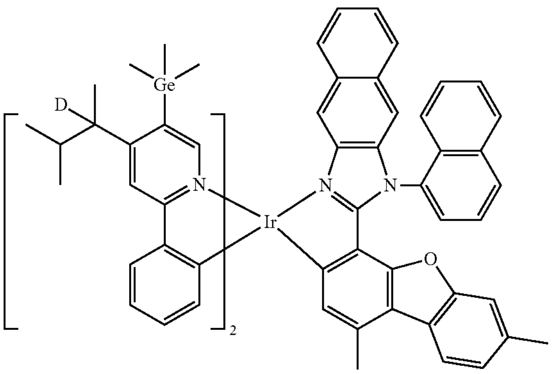
2863
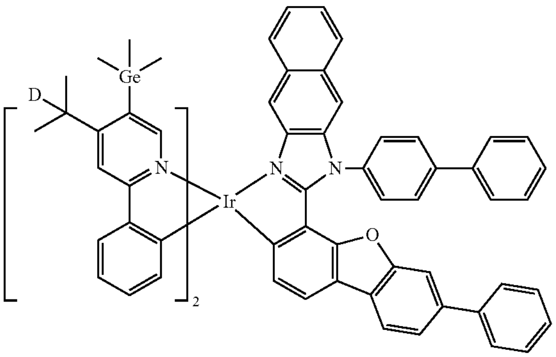
2864
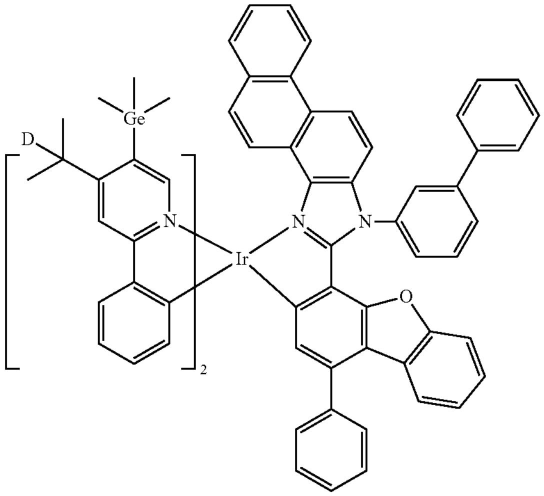
2865
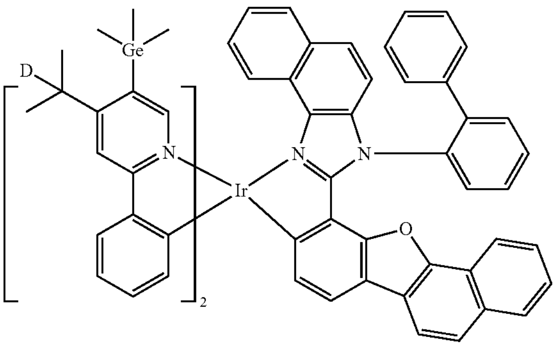
-continued
2866
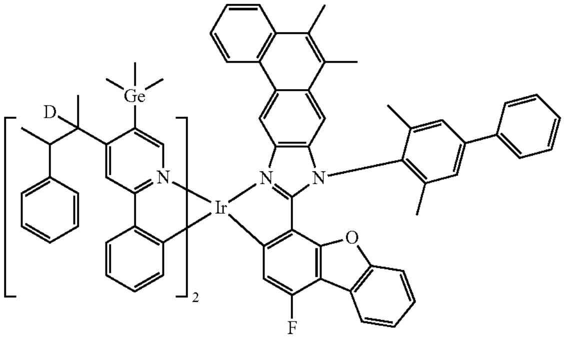
2867
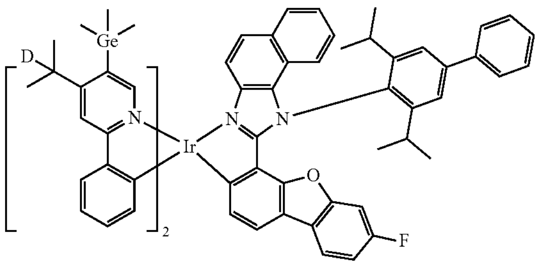
2868
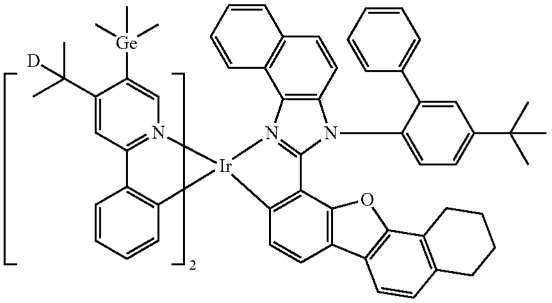
2869
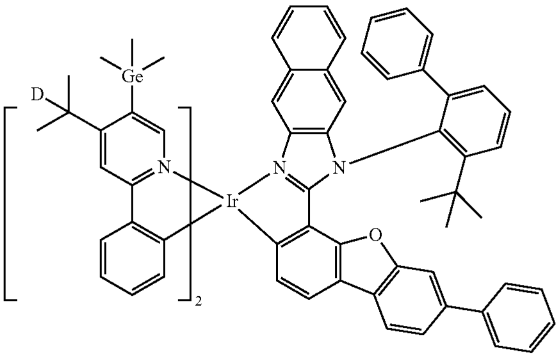

-continued
2870
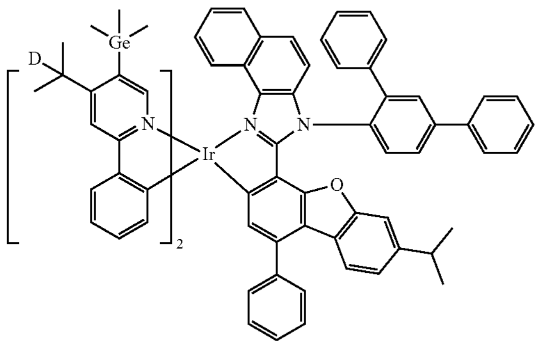
2871
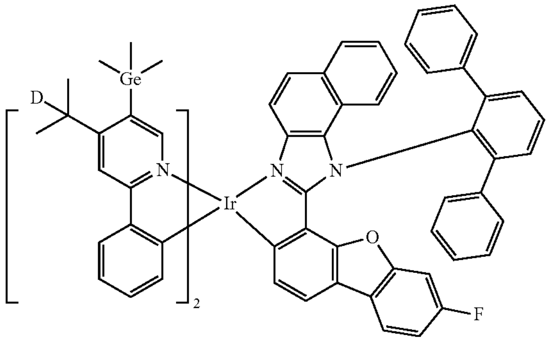
2872
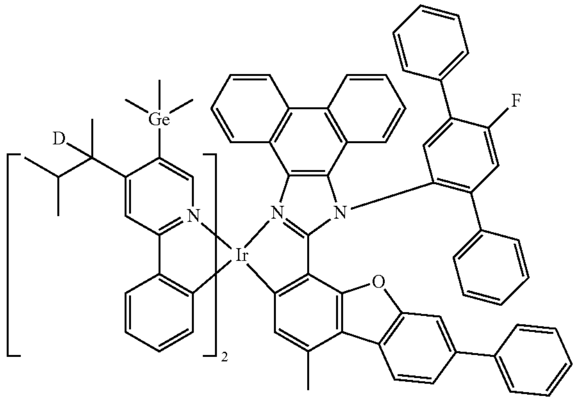
2873
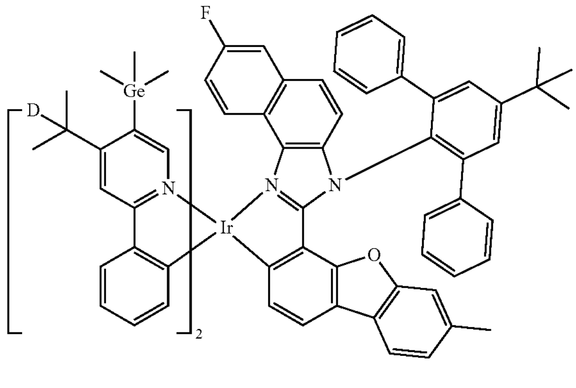
-continued
2874
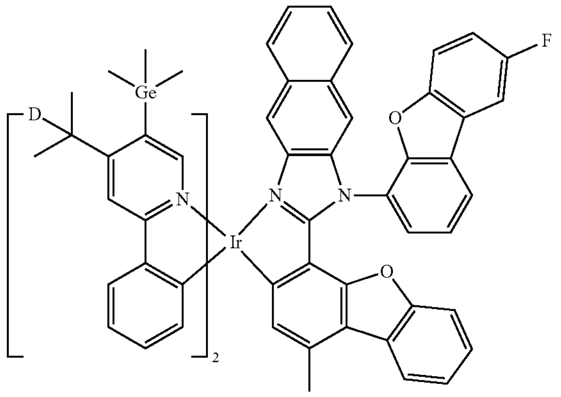
2875
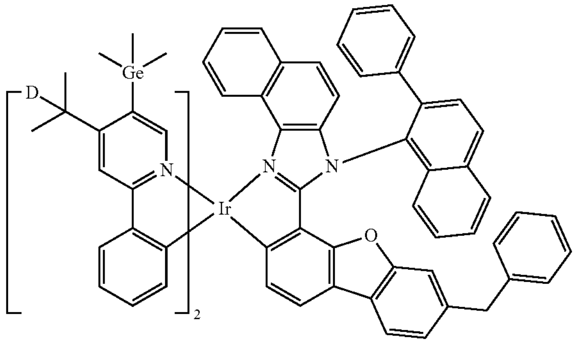
2876
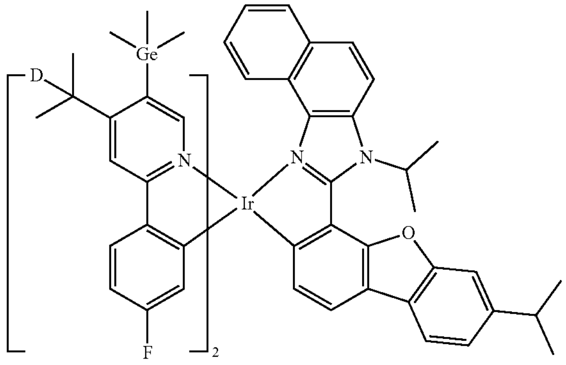
2877
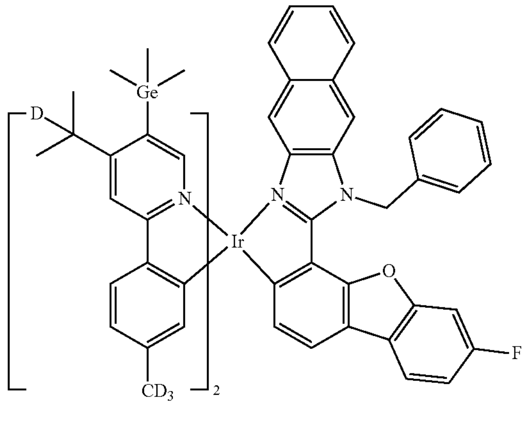

-continued
2878
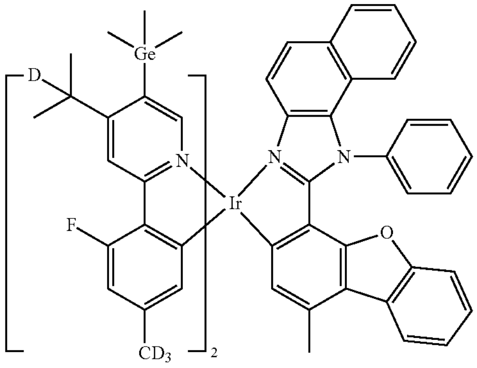
2789
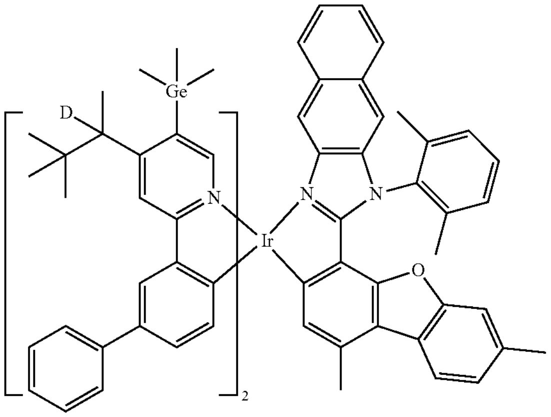
2880
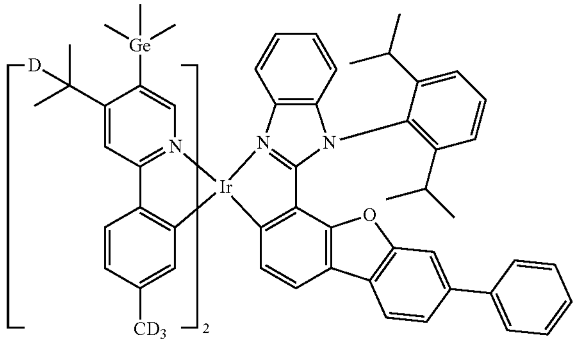
2881
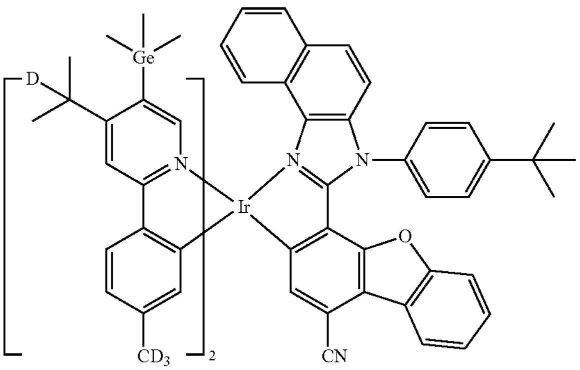
-continued
2882
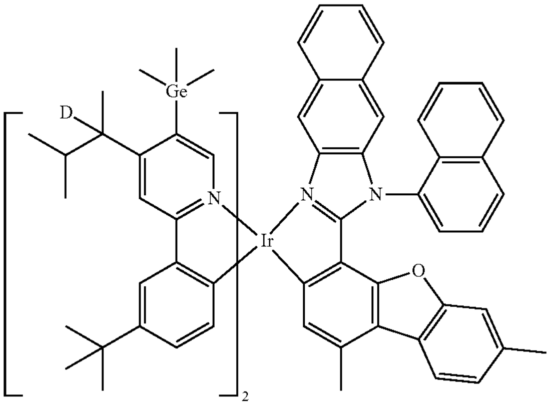
2883
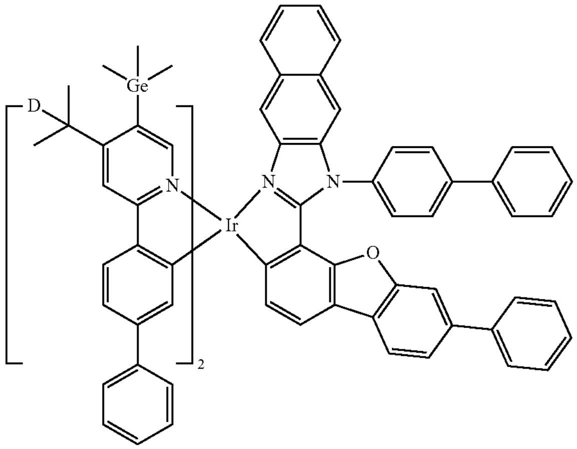
2884
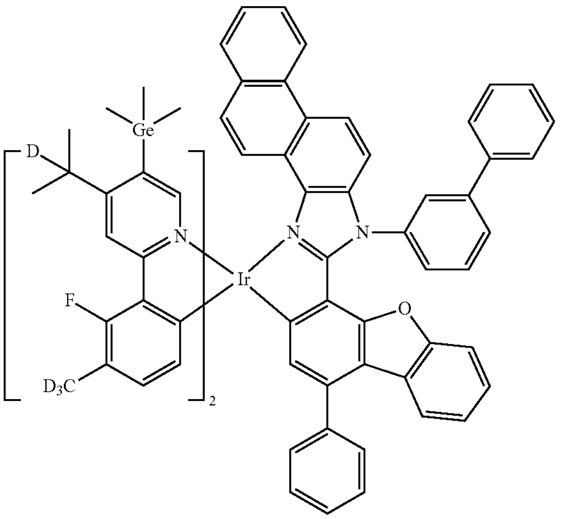

-continued
2885
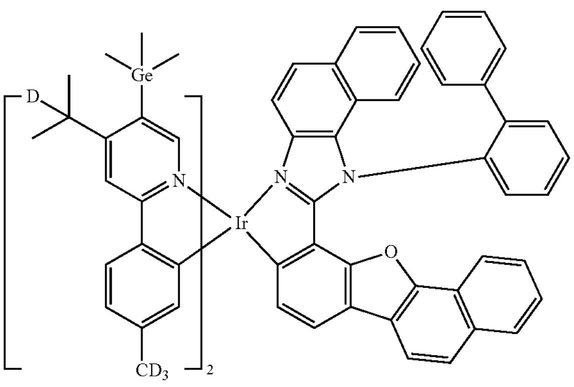
2886
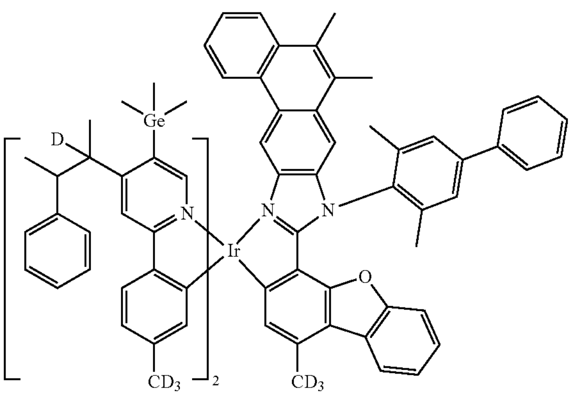
2887
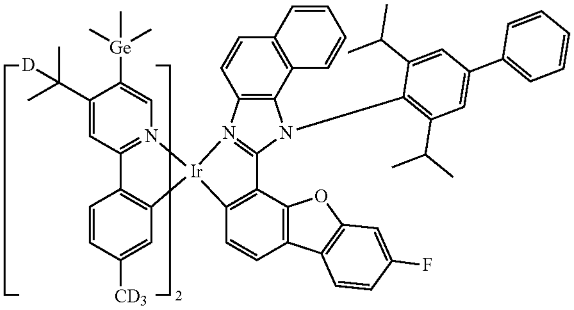
2888
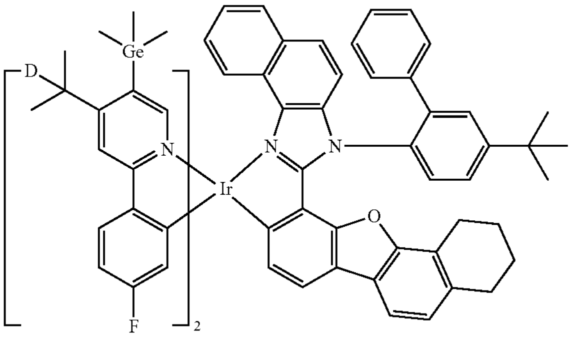
-continued
2889
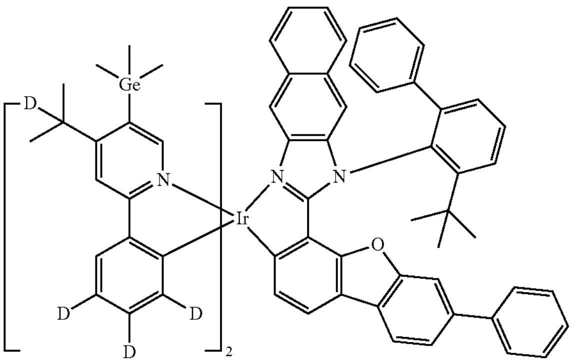
2890
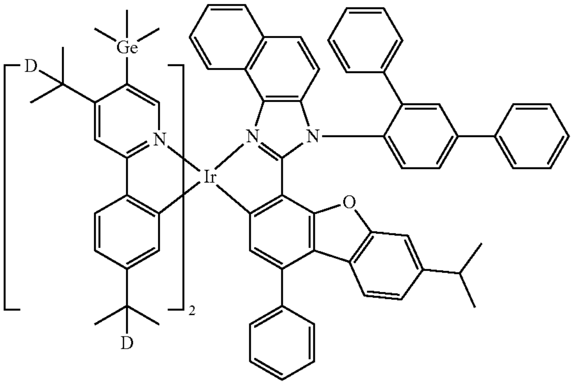
2891
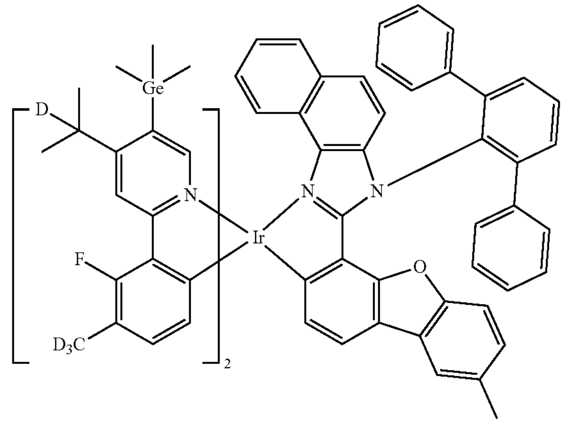
2892
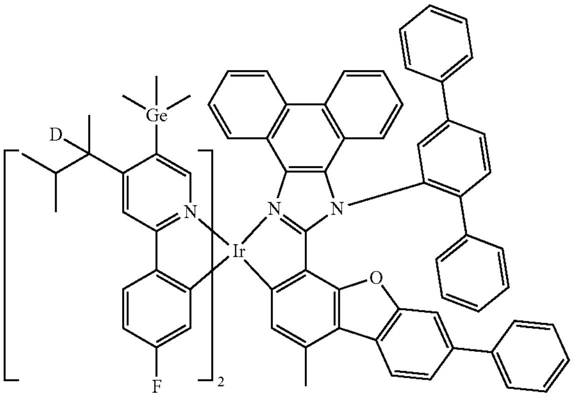

-continued
2893
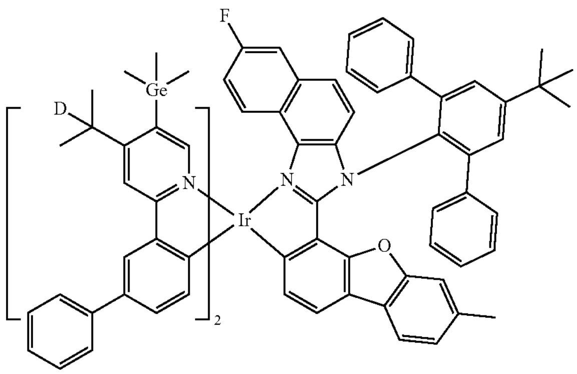
2894
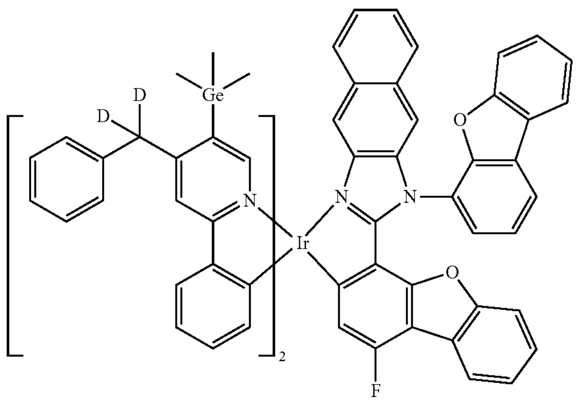
2895
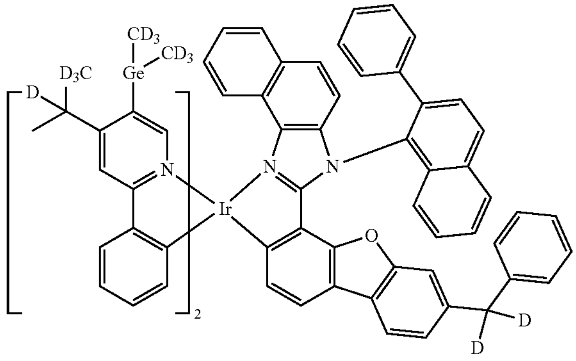
2896
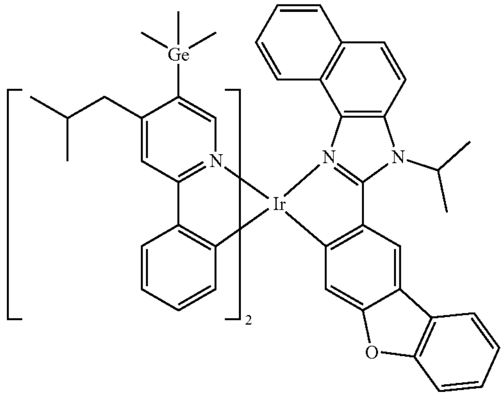
-continued
2897
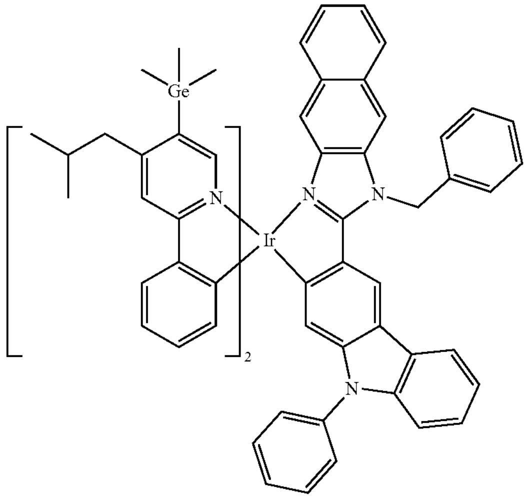
2898
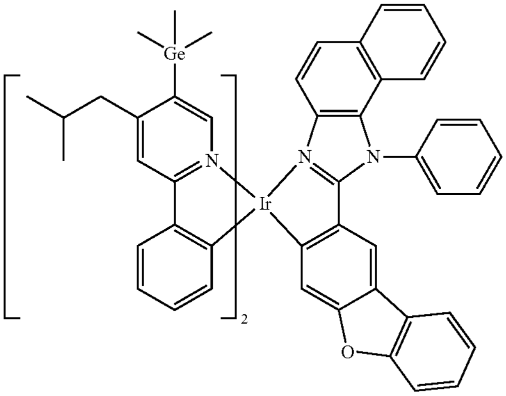
2899
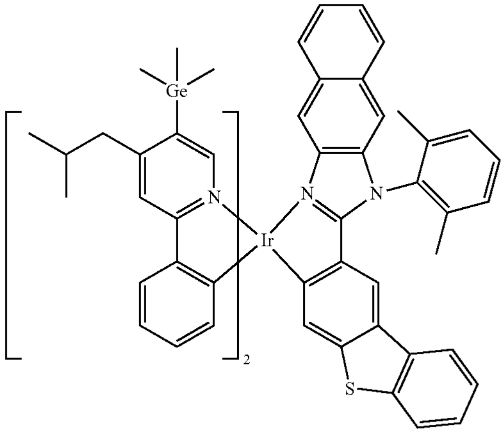

2900
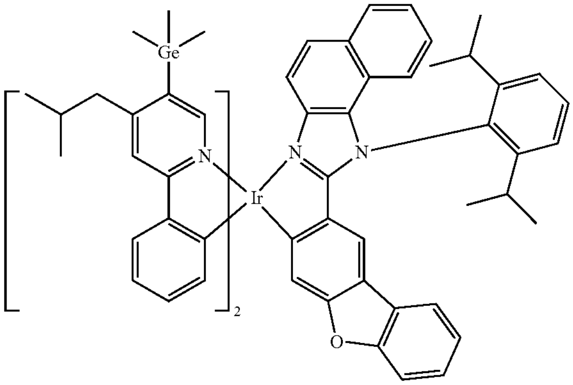
2901
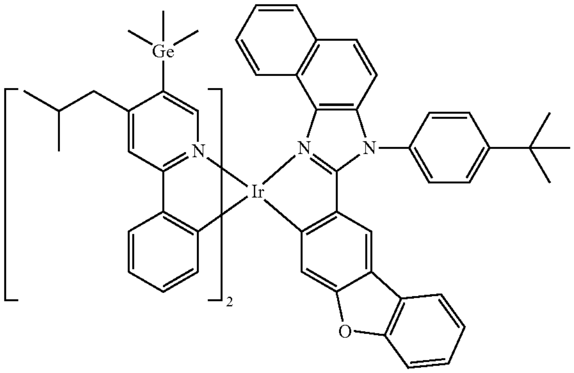
2902
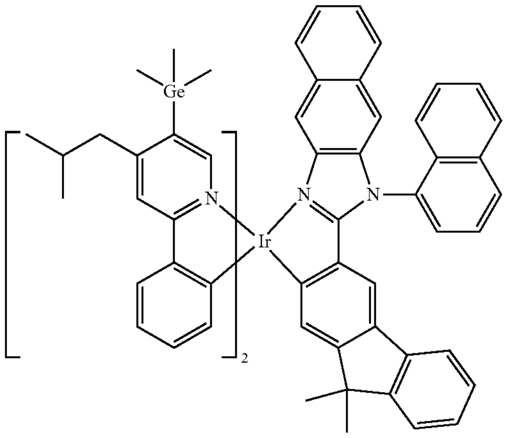
2903
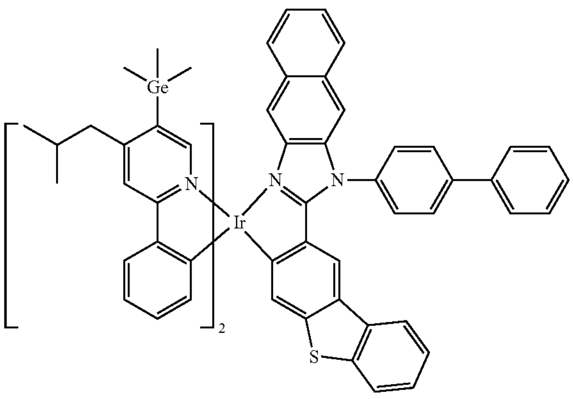
2924
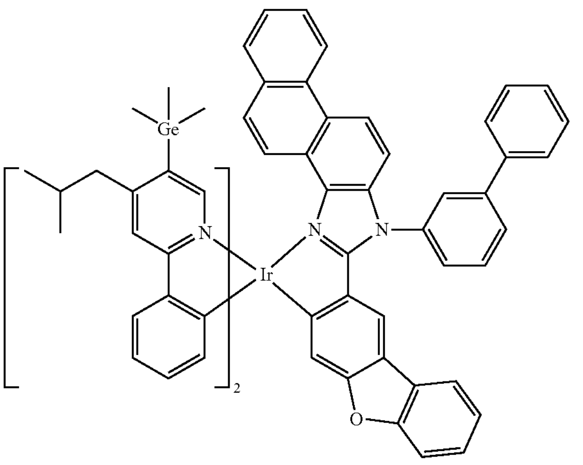
2905
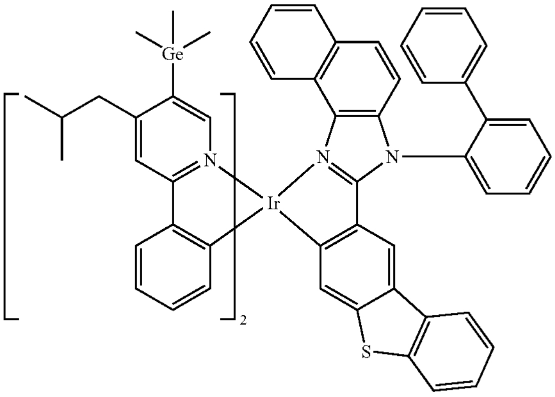
2906
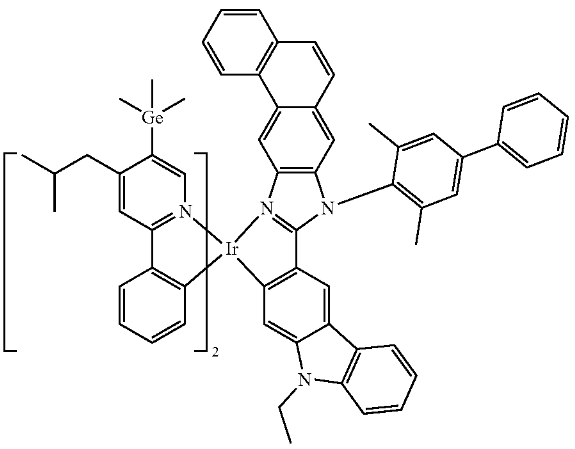

-continued
2907
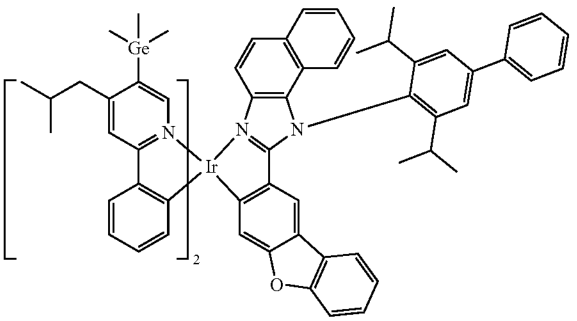
2908
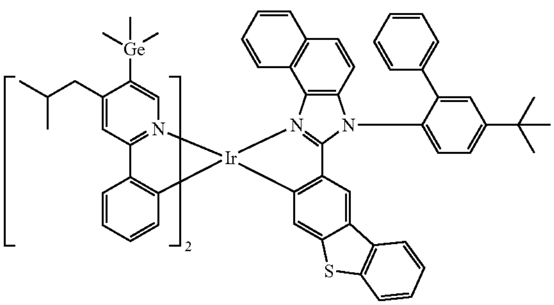
2909
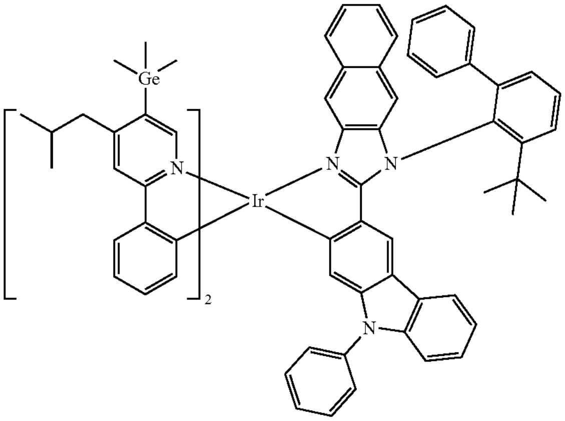
2910
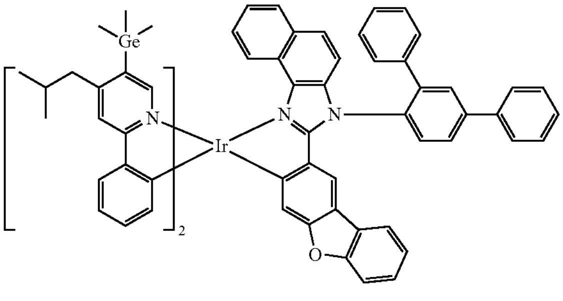
-continued
2911
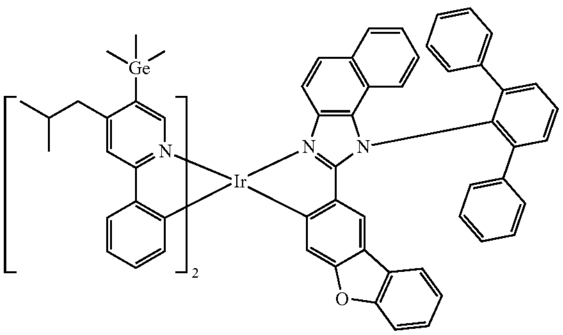
2912
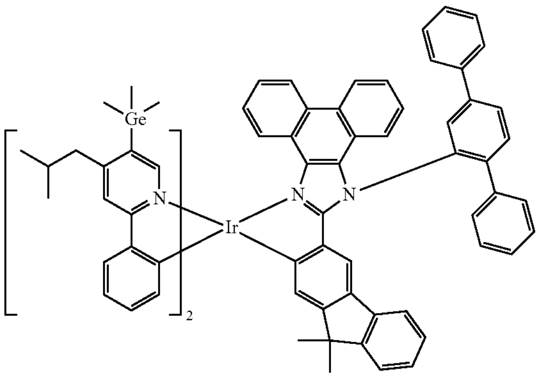
2913
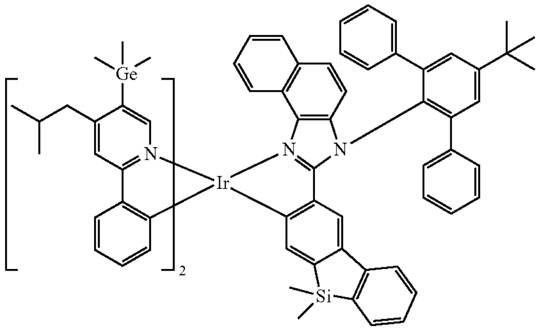
2914
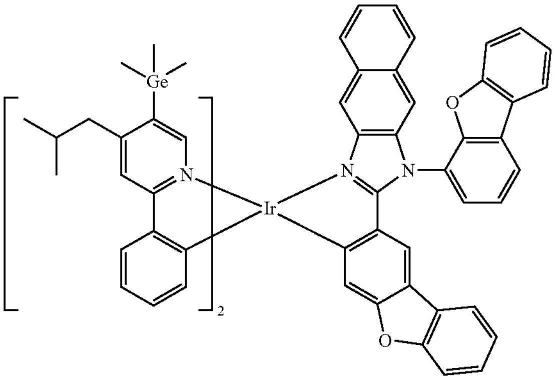

-continued
2915
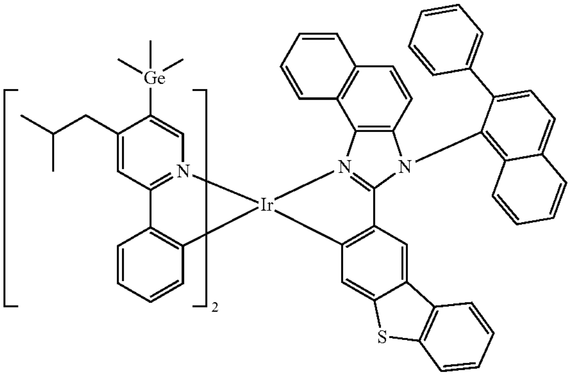
2916
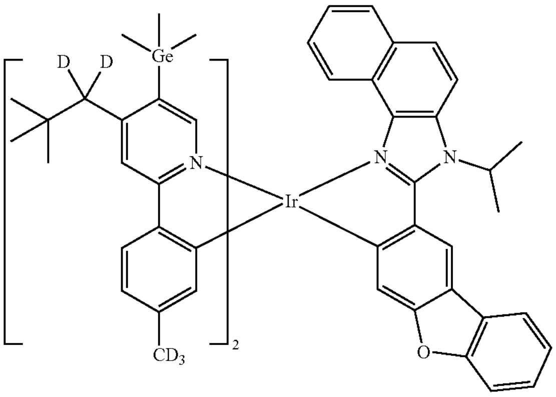
2917
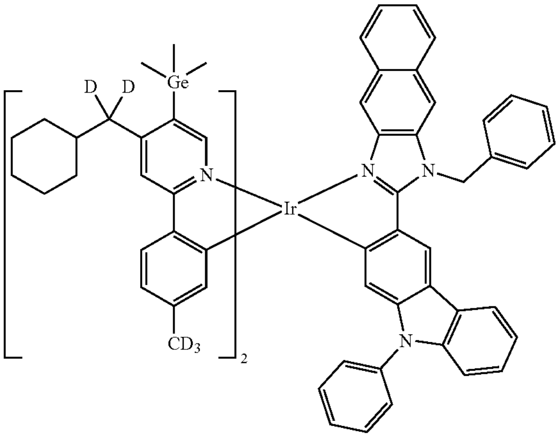
-continued
2918
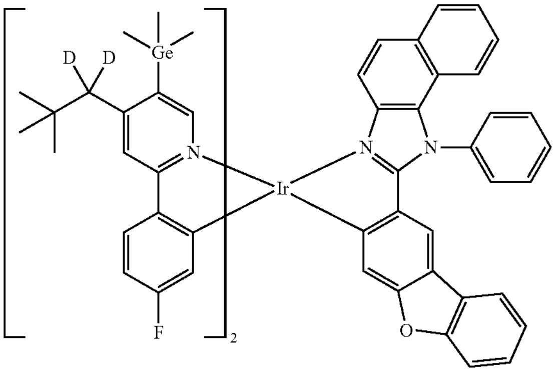
2919
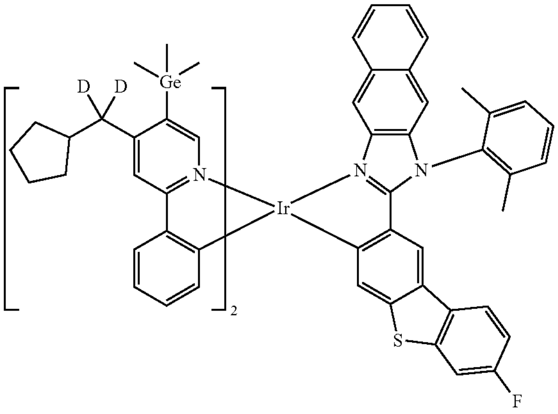
2920
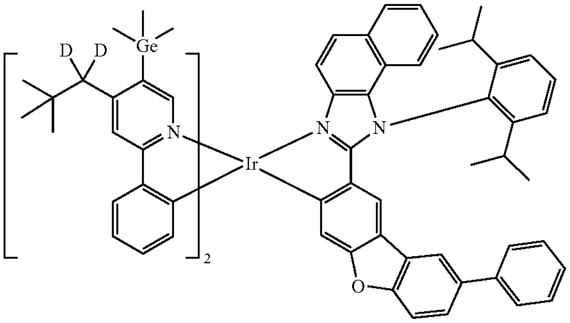
2921
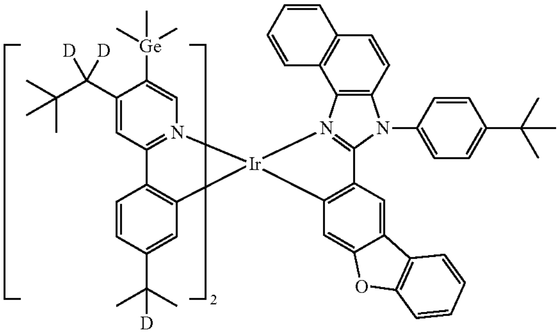

-continued
2922
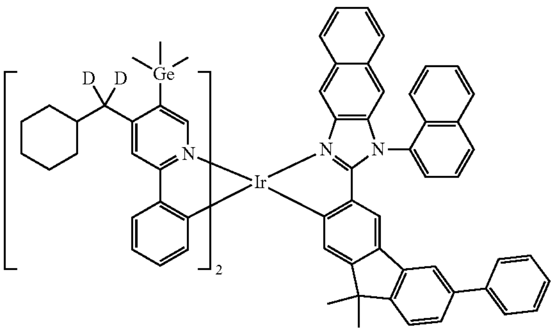
2923
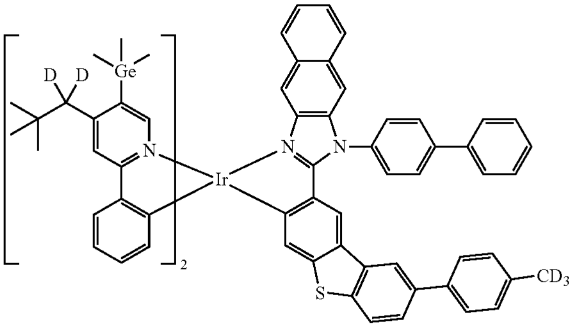
2924
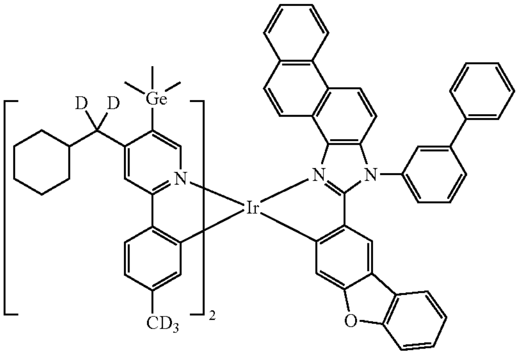
2925
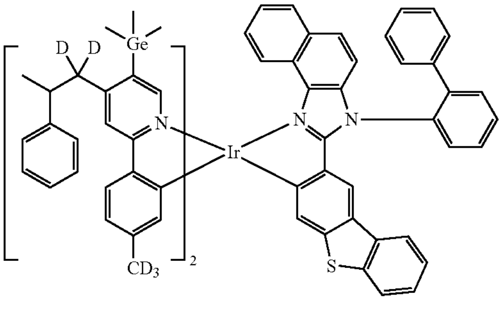
-continued
2926
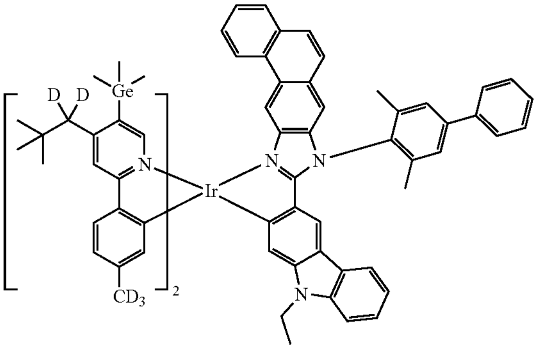
2927
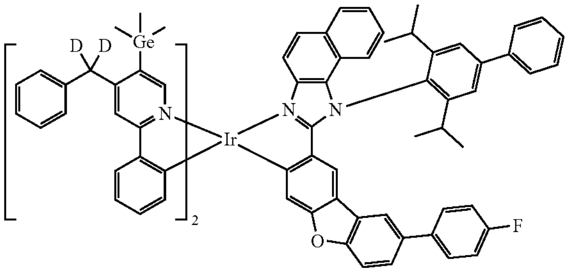
2928
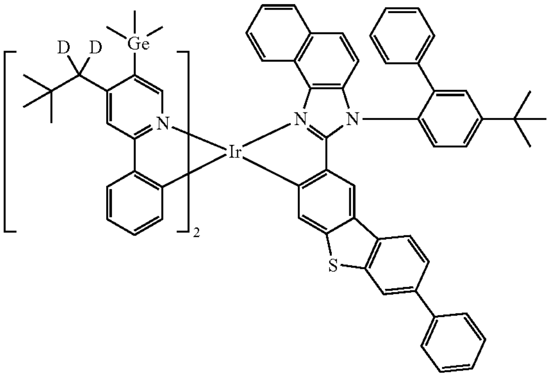
2929
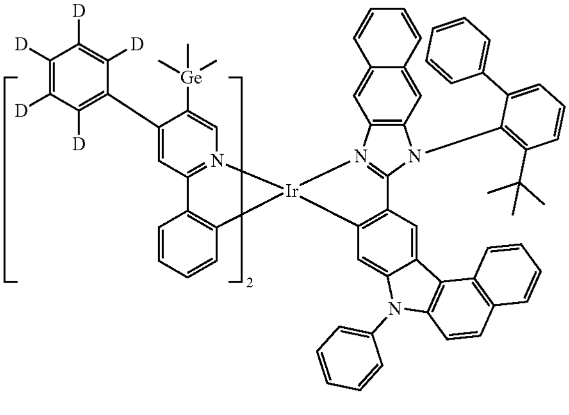

-continued
2930
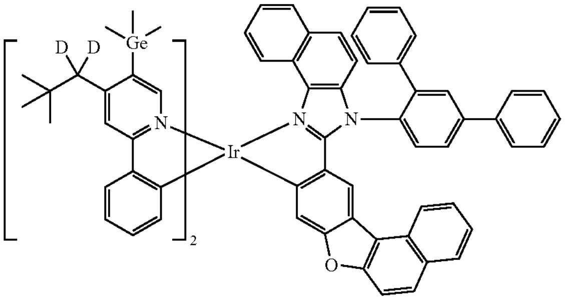
2931
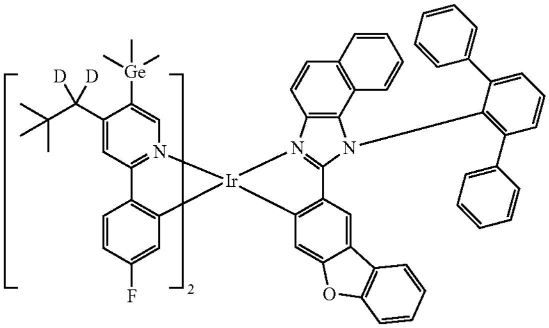
2932
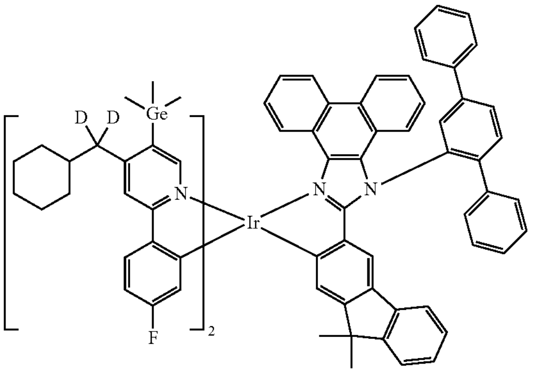
2933
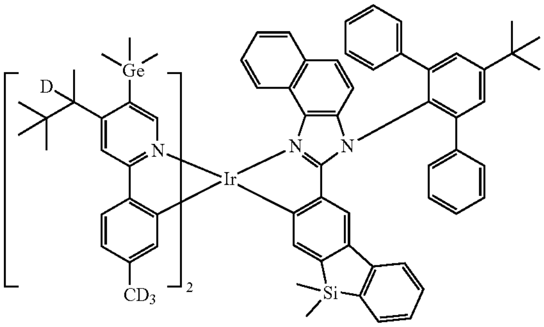
-continued
2934
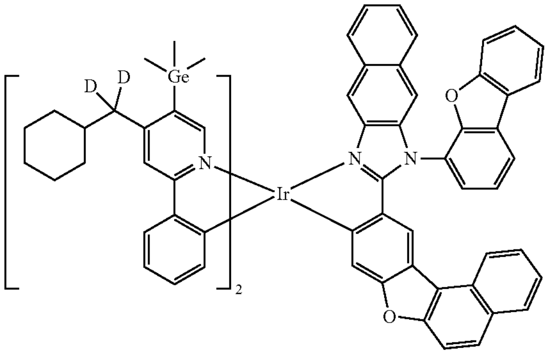
2935
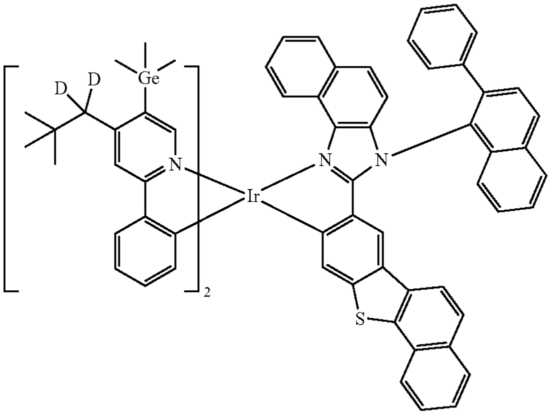
2936
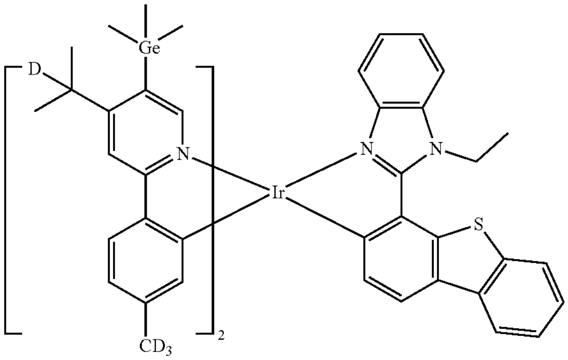
2937
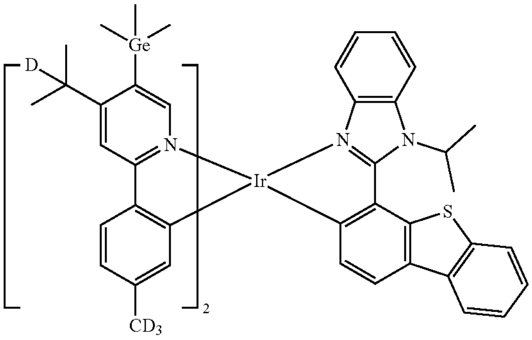

-continued
2938
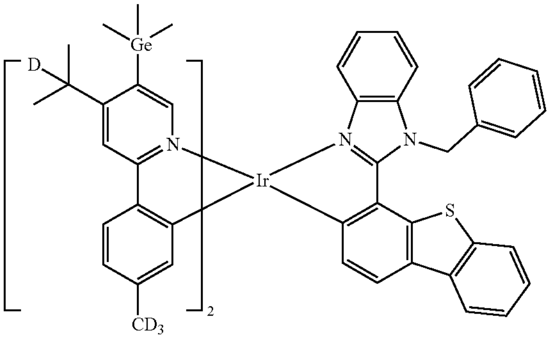
2939
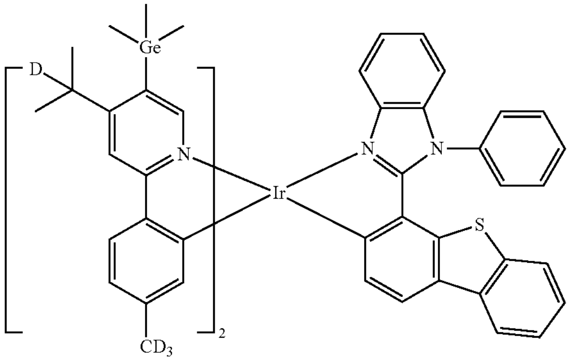
2940
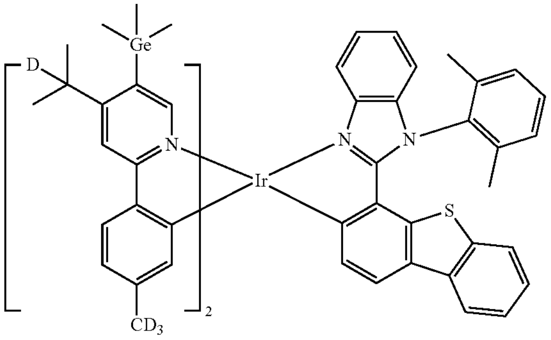
2941
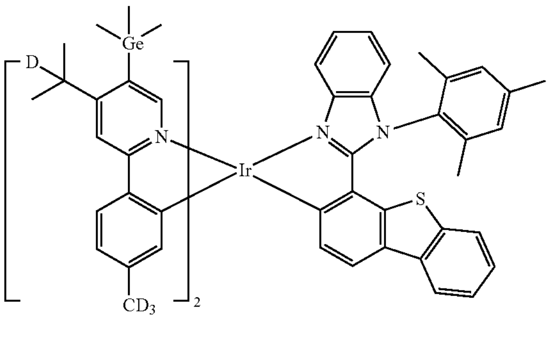
-continued
2942
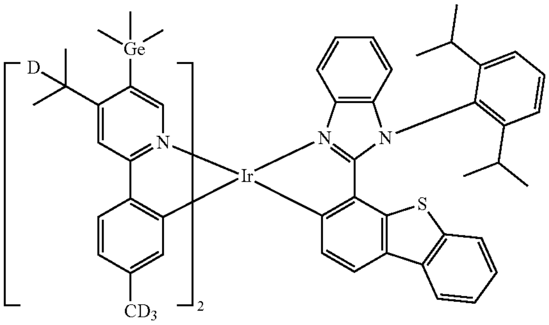
2943
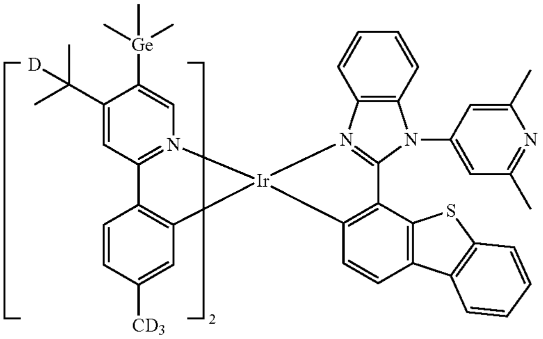
2944
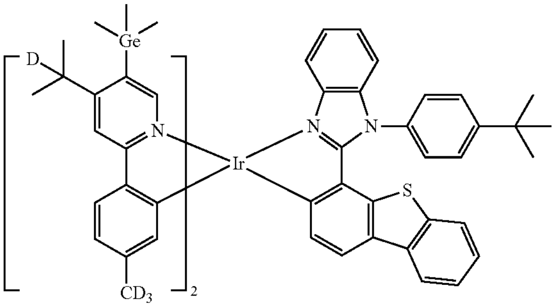
2945
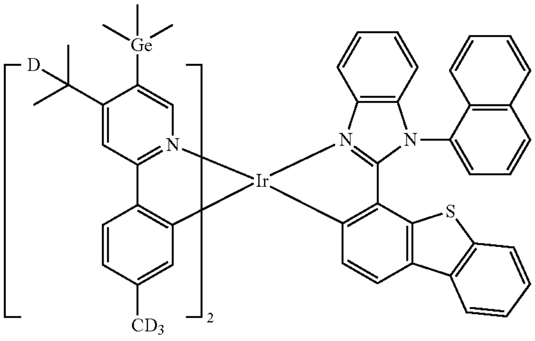

-continued
2946
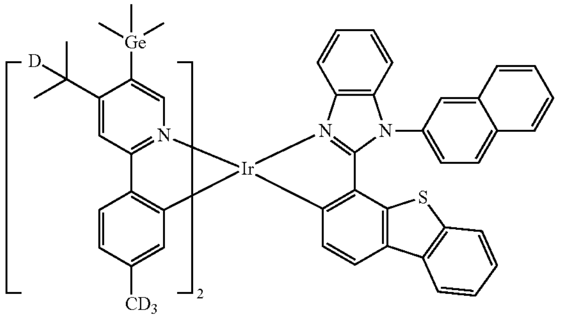
2947
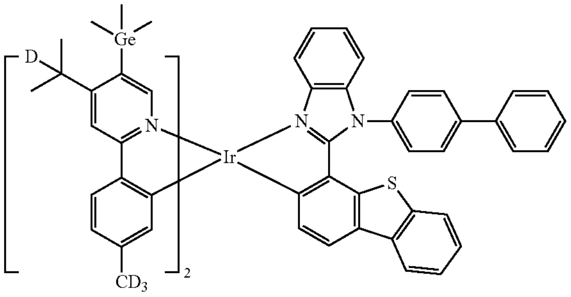
2948
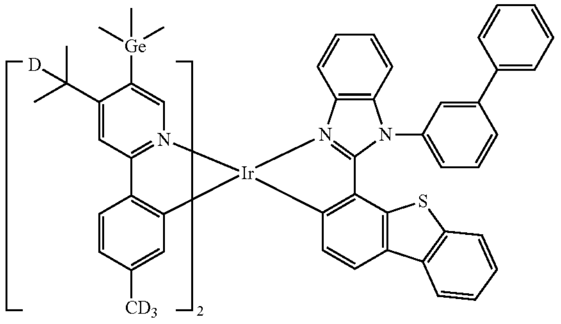
2949
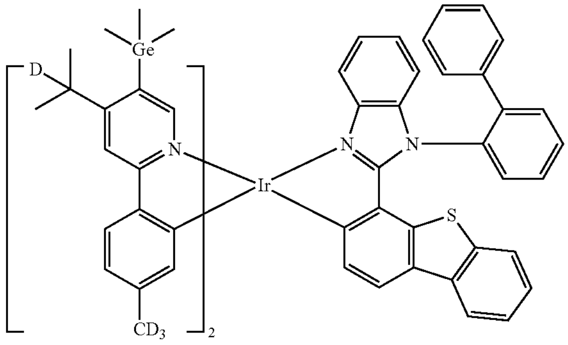
-continued
2950
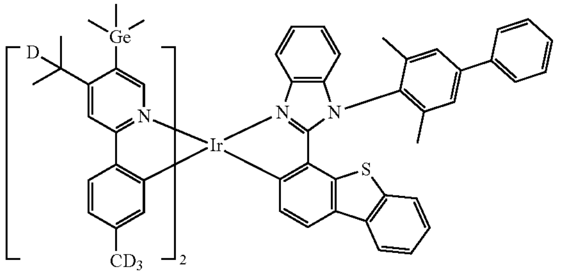
2951
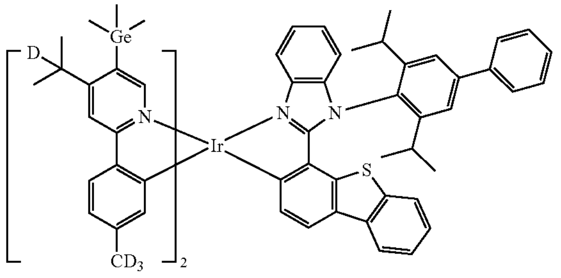
2952
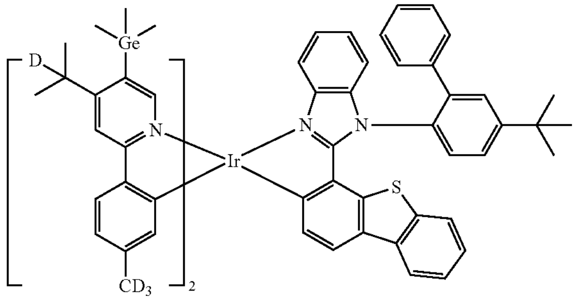
2953
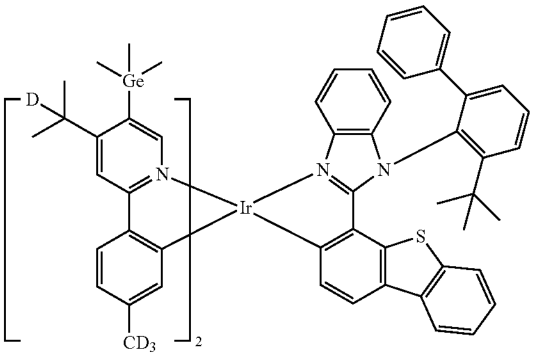
2954
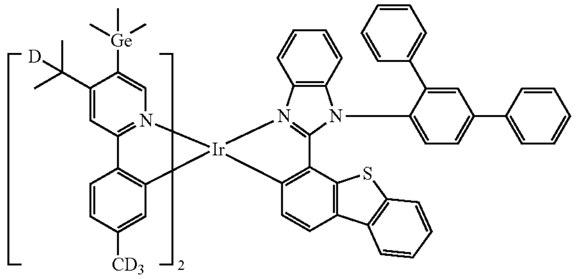

-continued
2955
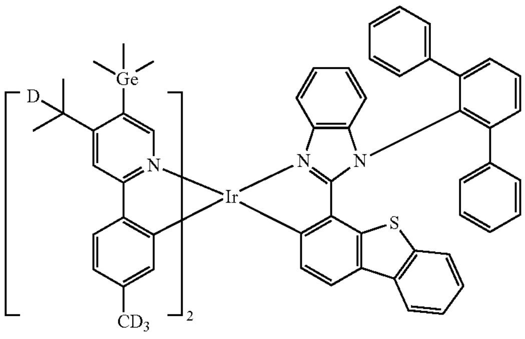
2956
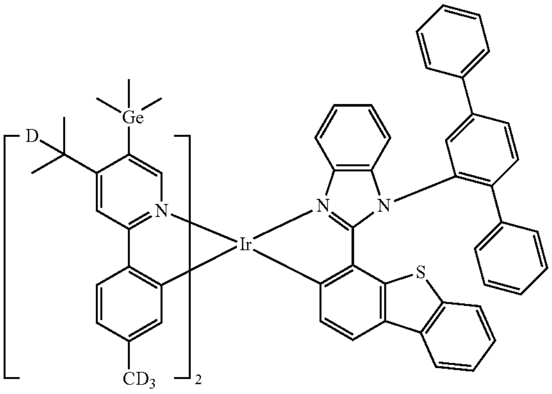
2957
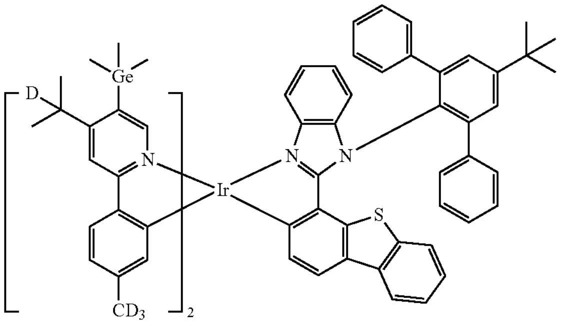
2958
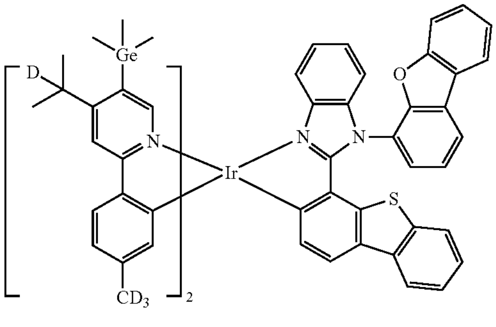
-continued
2959
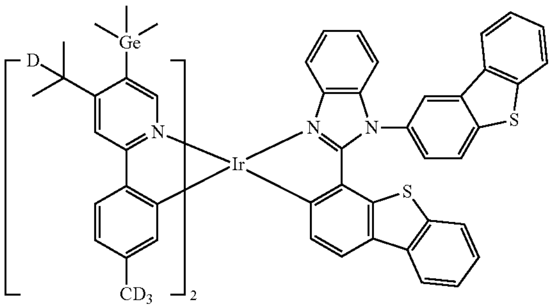
2960
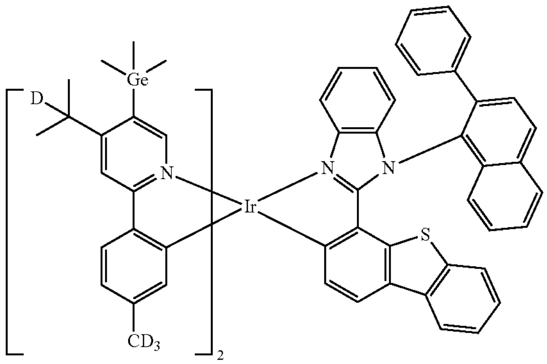
2961
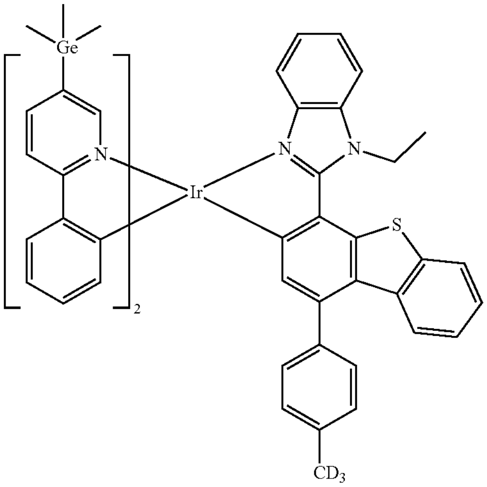

-continued
2962
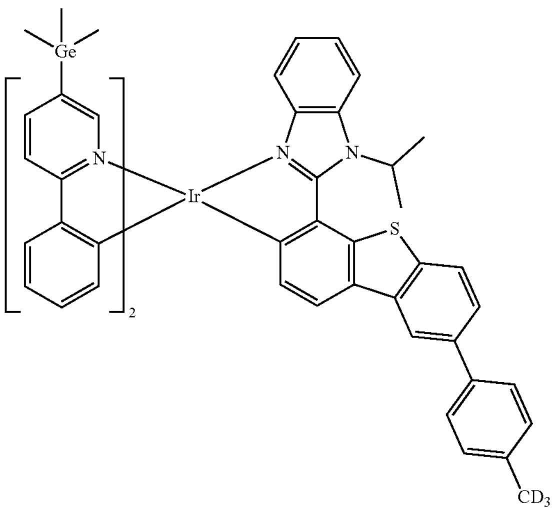
2963
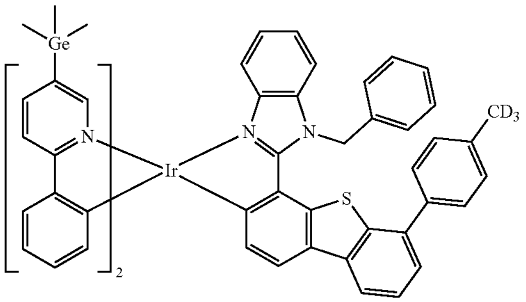
2964
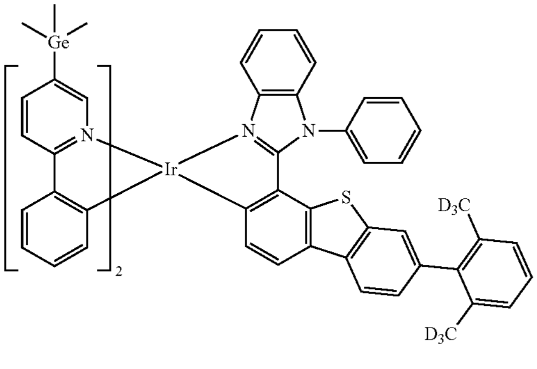
-continued
2965
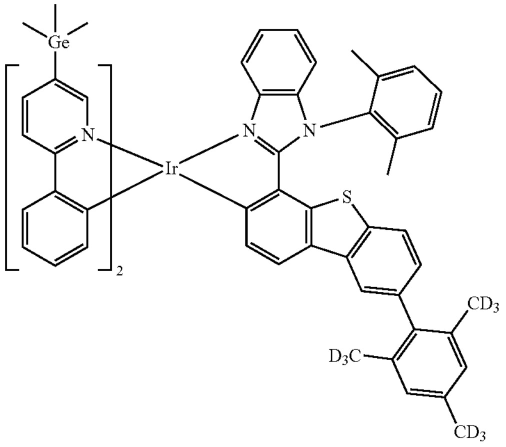
2966
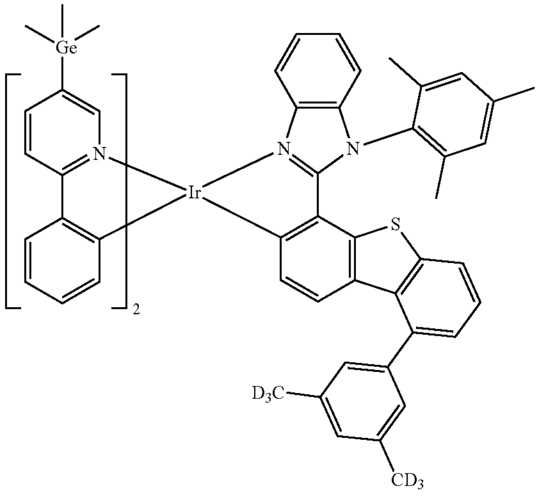
2967
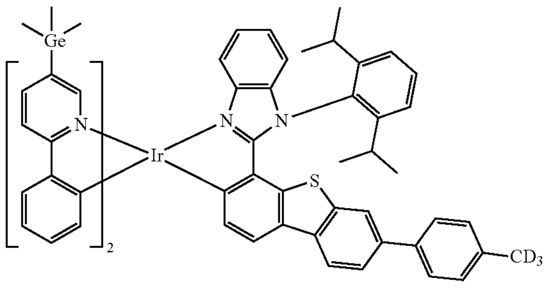

2968
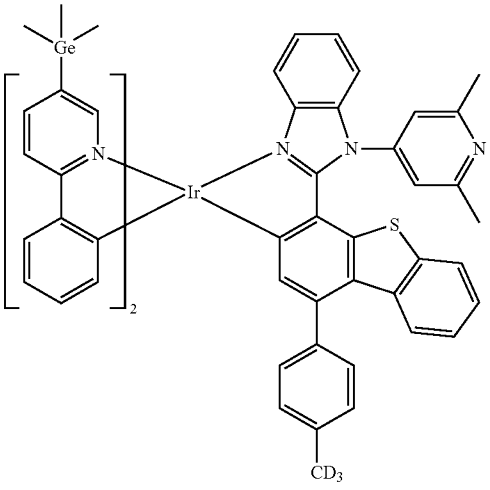
2969
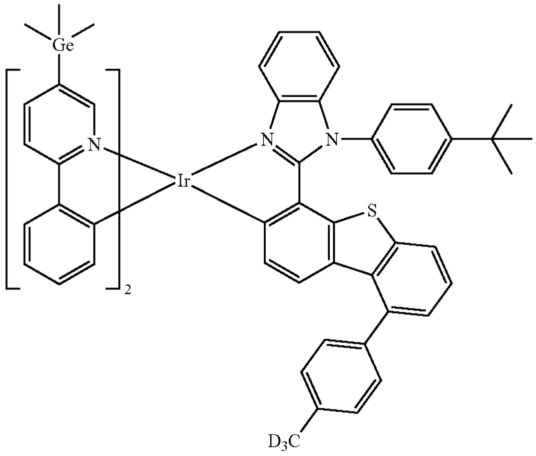
2970
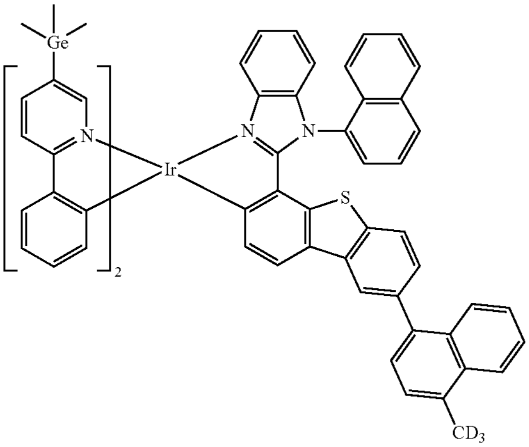
2971
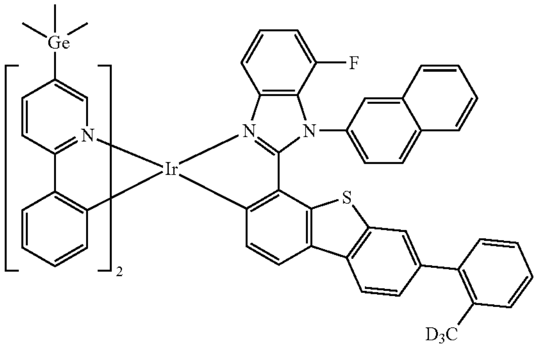
2972
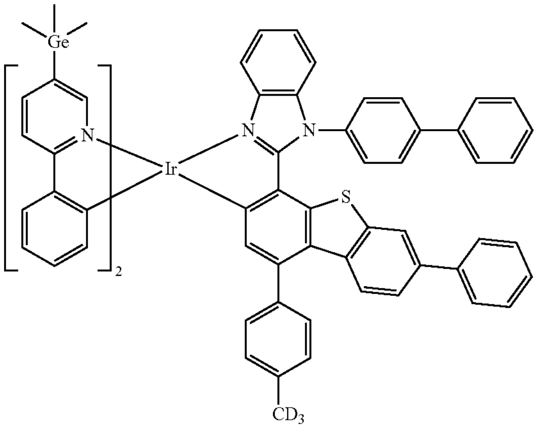
2973
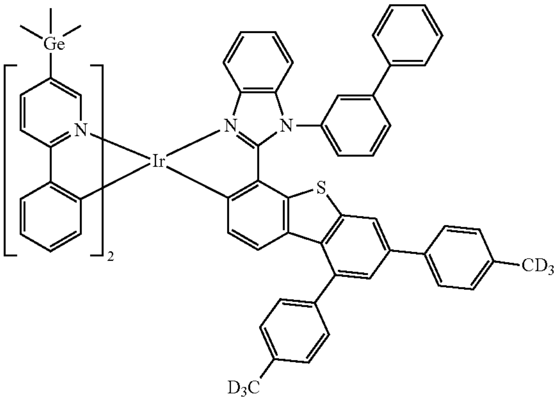
2974
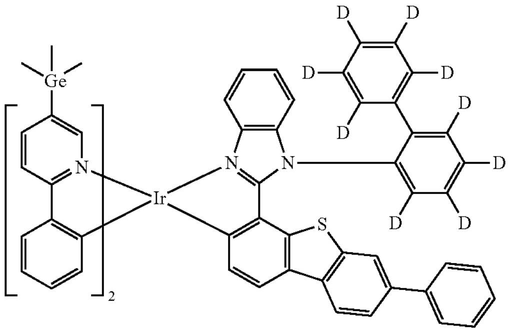

-continued
2975
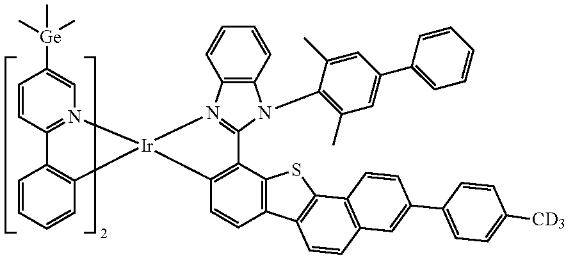
2976
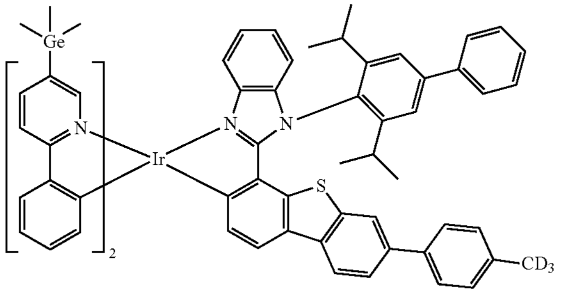
2977
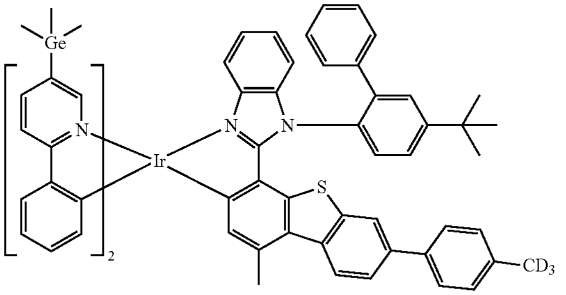
2978
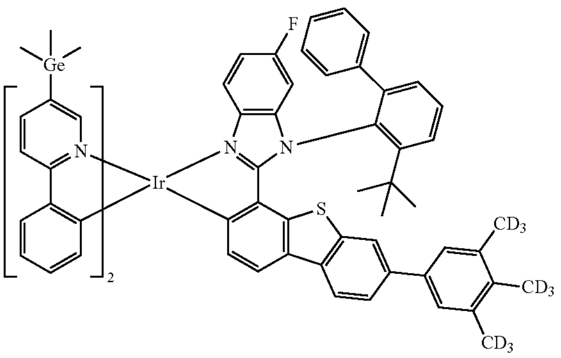
2979
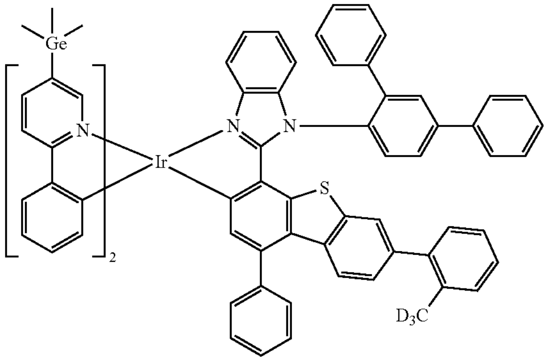
2980
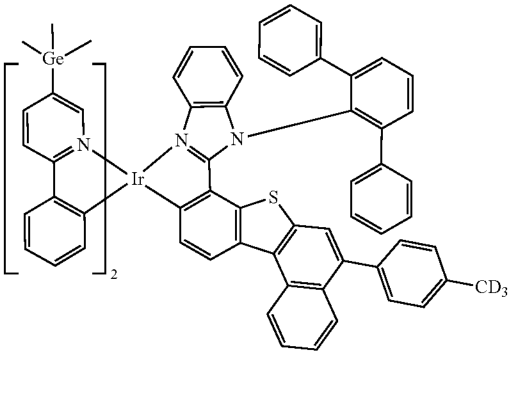
2981
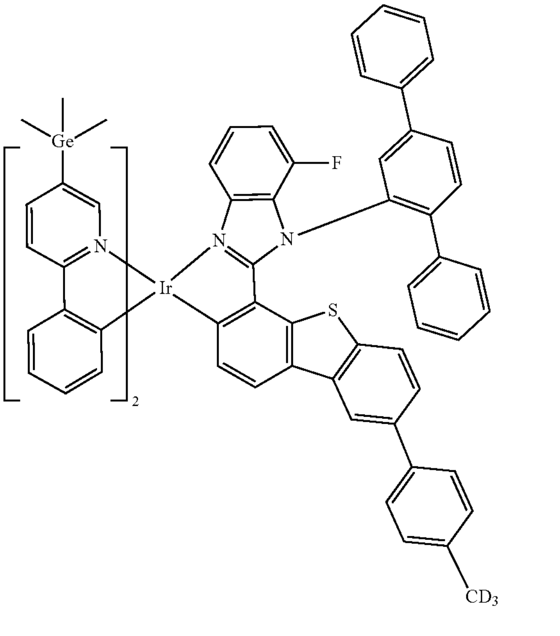

-continued
2982
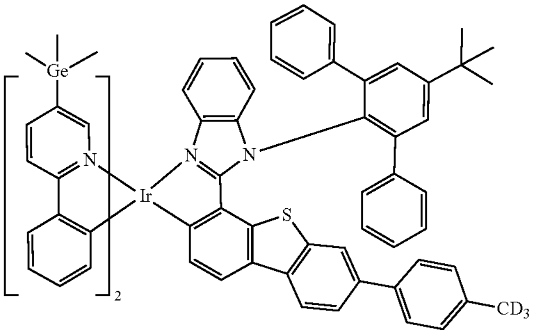
2983
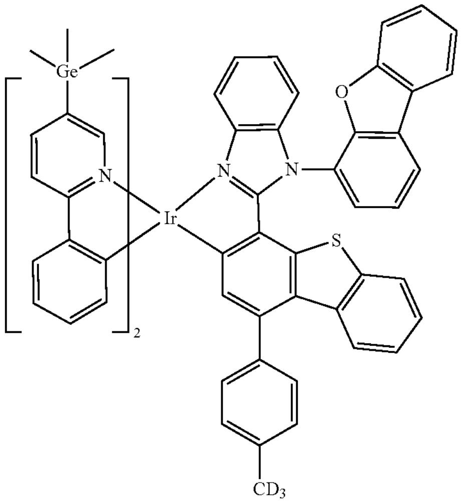
2984
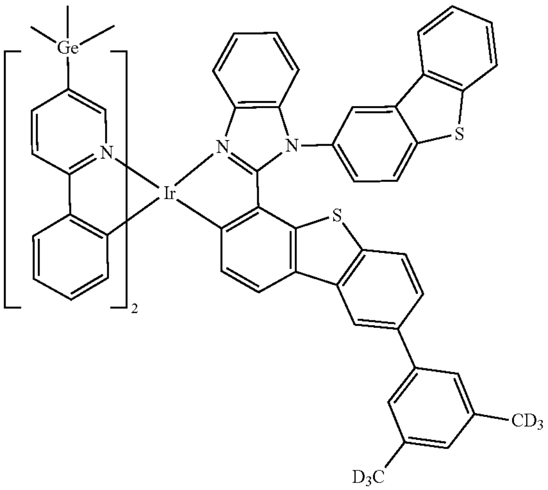
2985
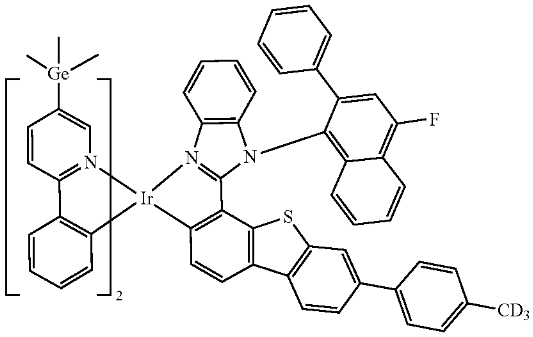
2986
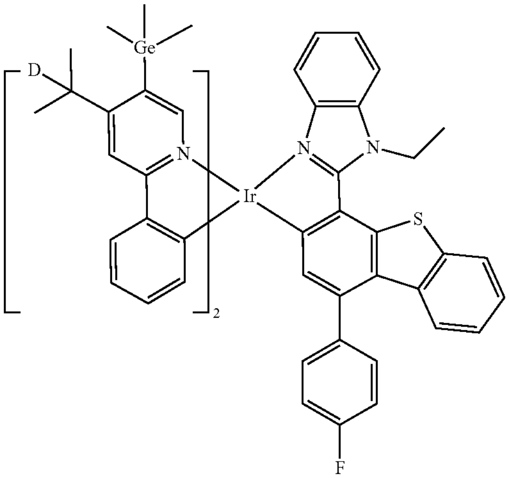
2987
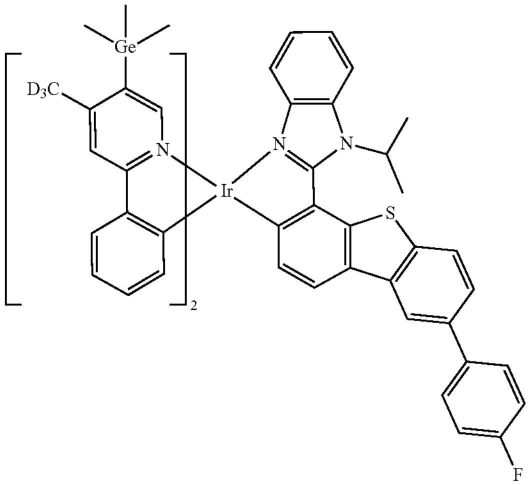

-continued
2988
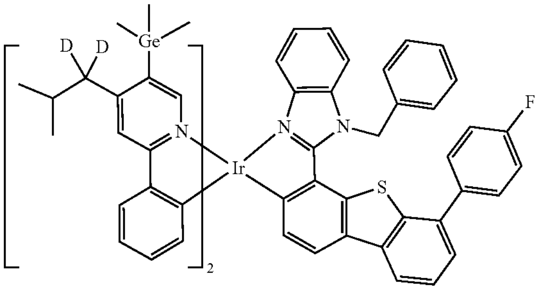
2989
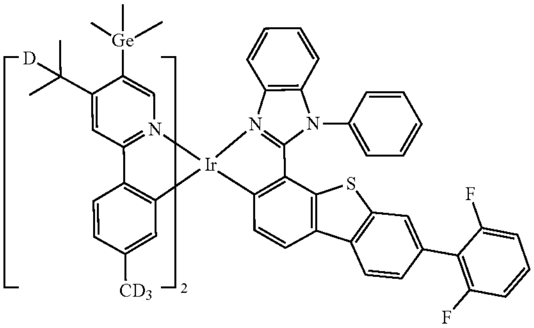
2990
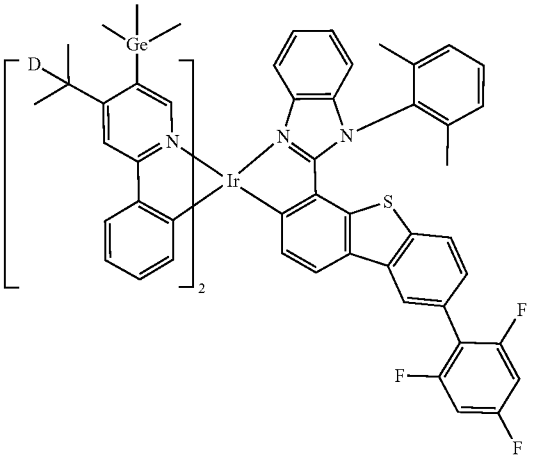
2991
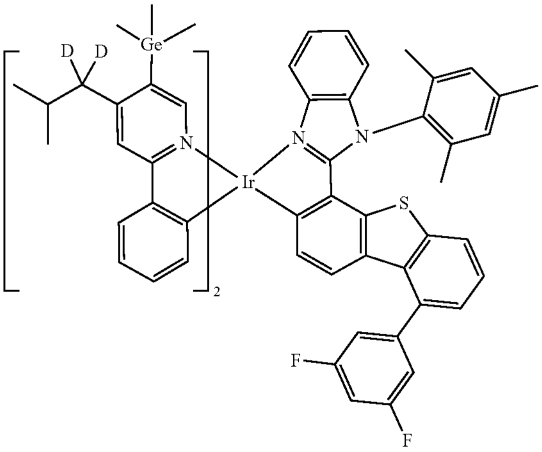
2992
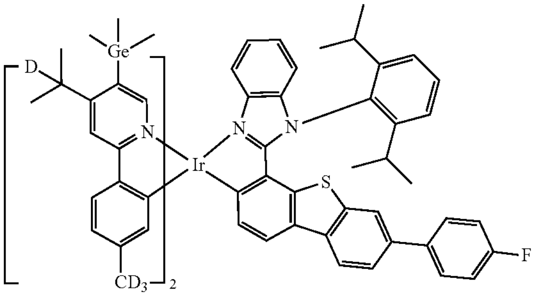
2993
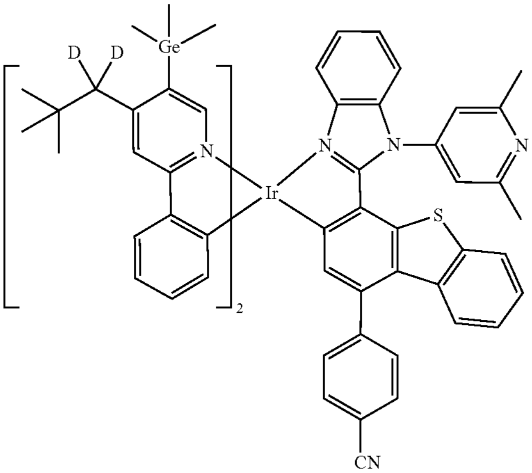

-continued
2990
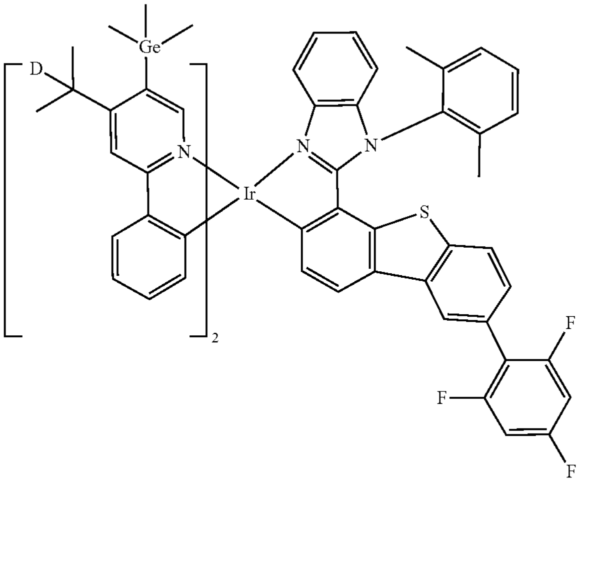
2994
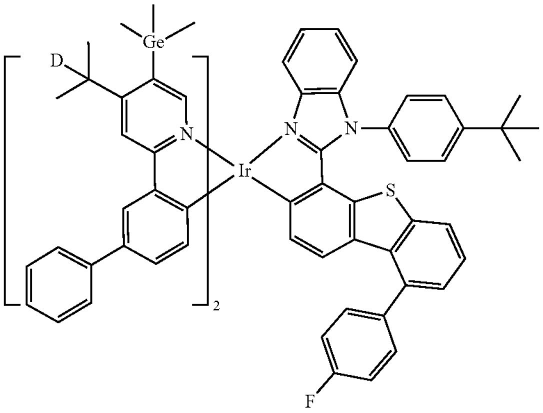
2995
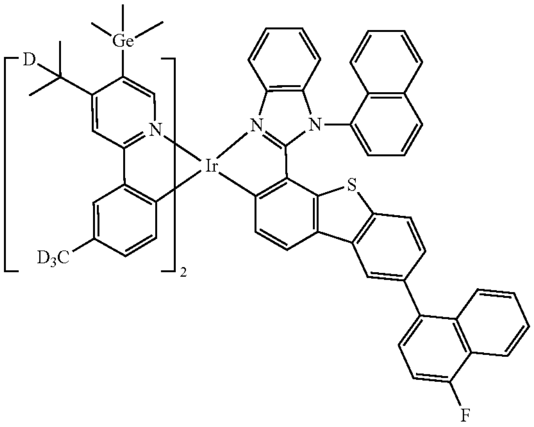
2996
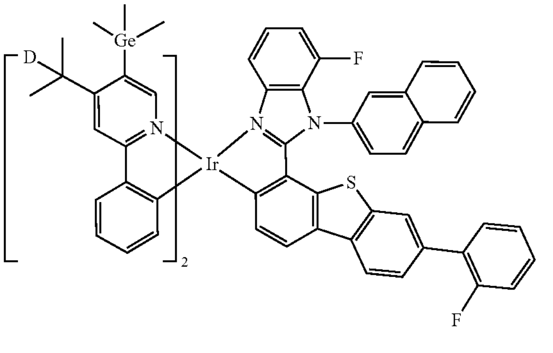
2997
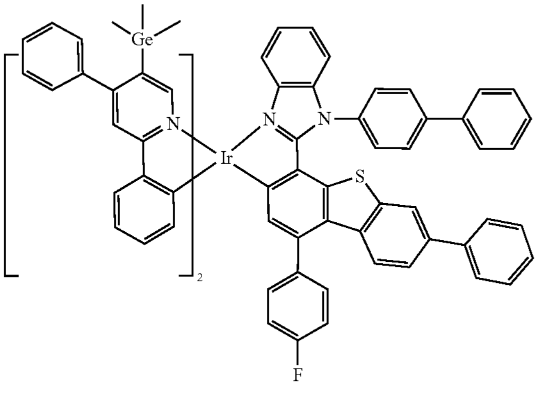

-continued
2998
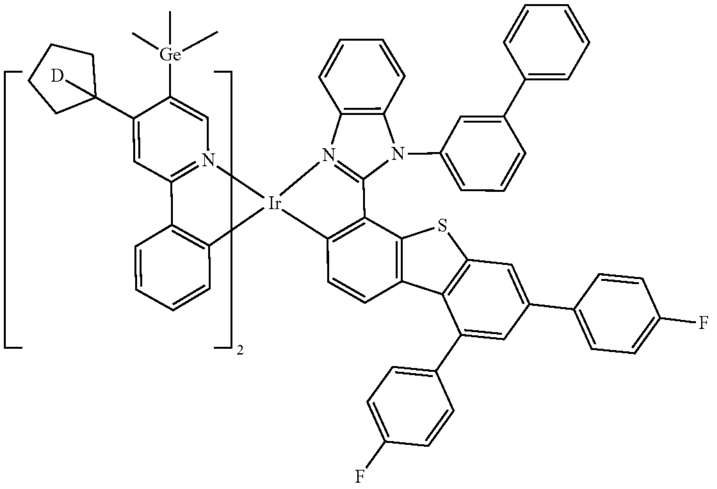
2999
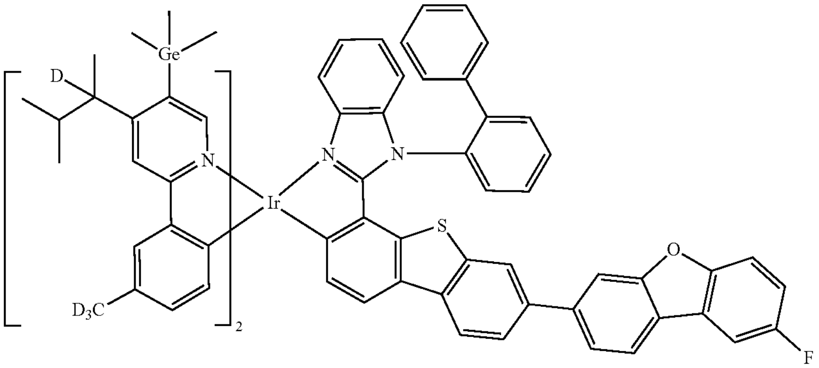
3000
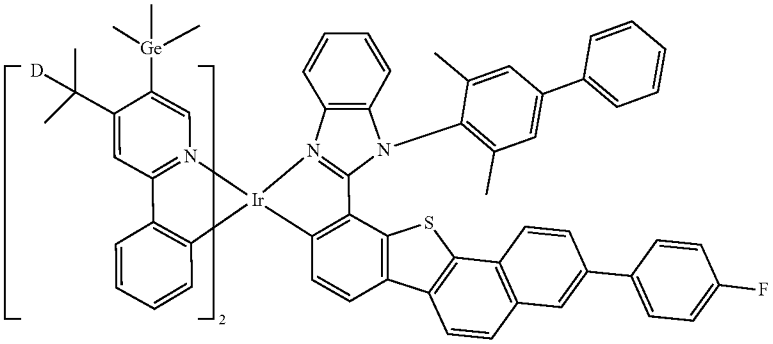
3001
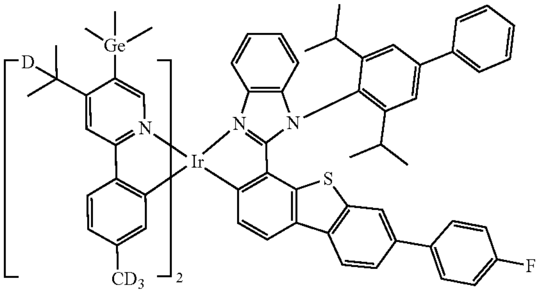
3002
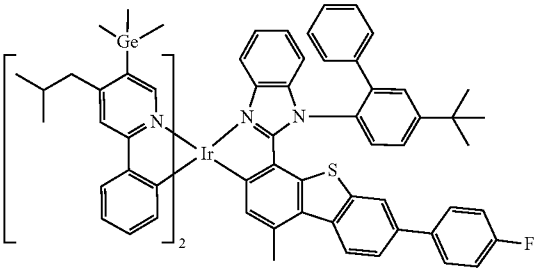

-continued
3003
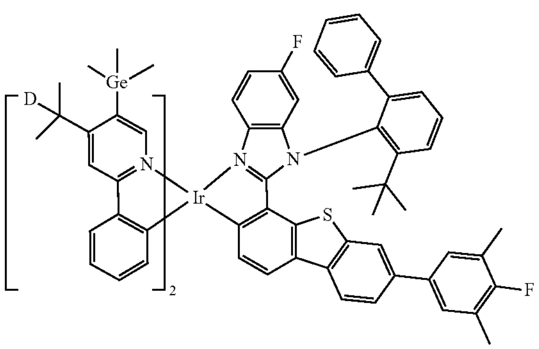
3004
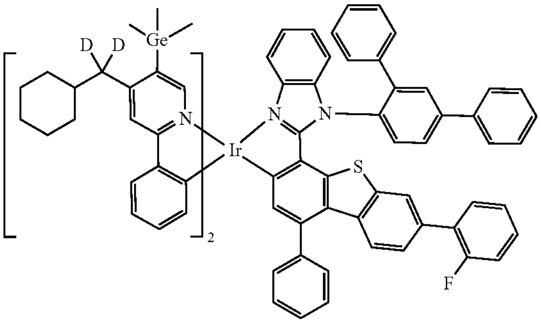
3005
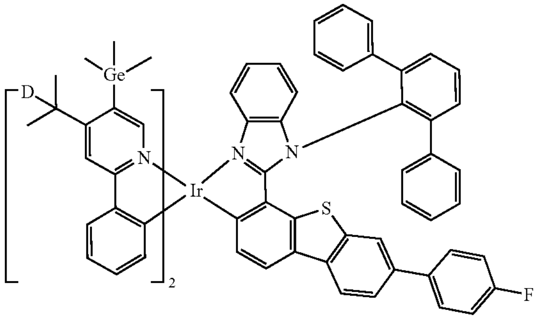
3006
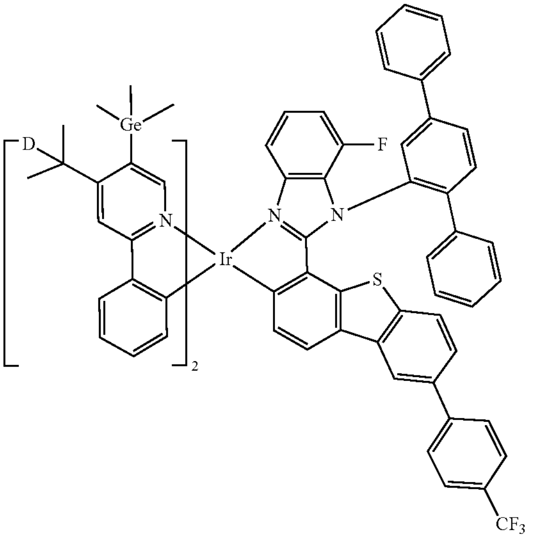

-continued
3007
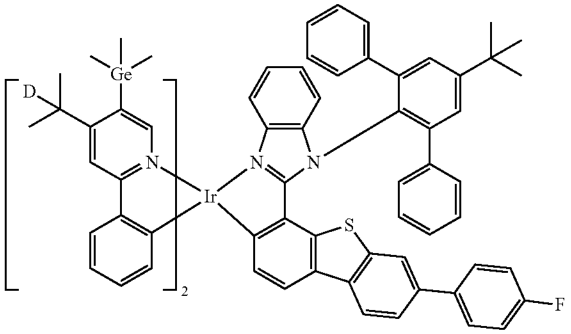
3008
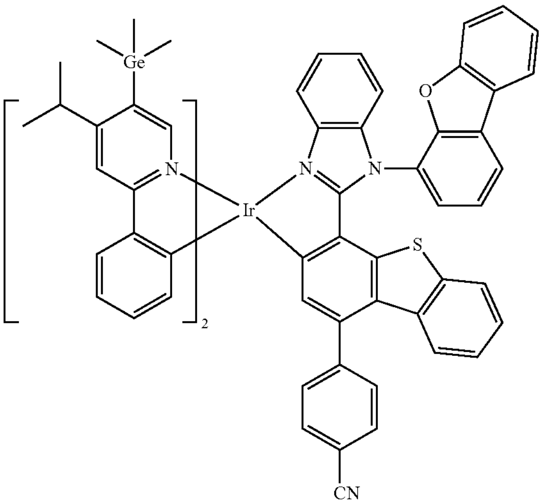
3009
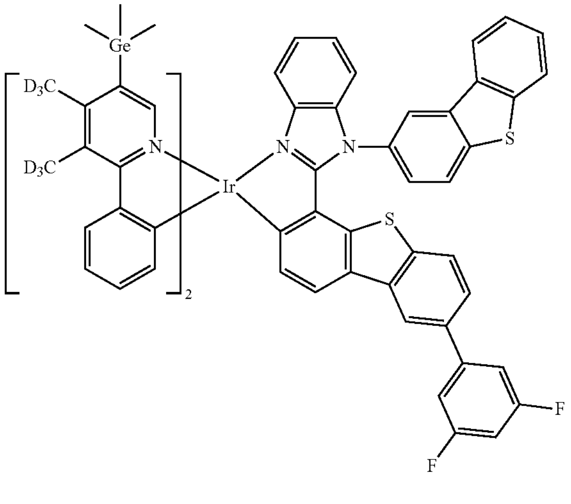
3010
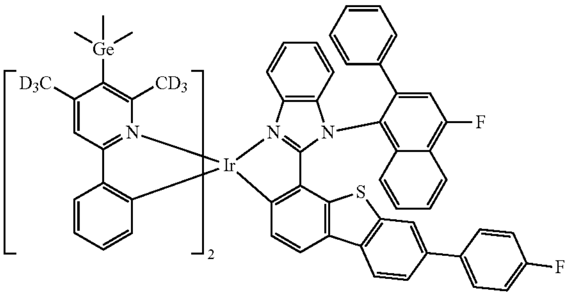
3011
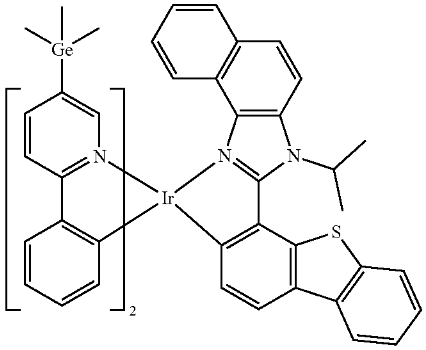
3012
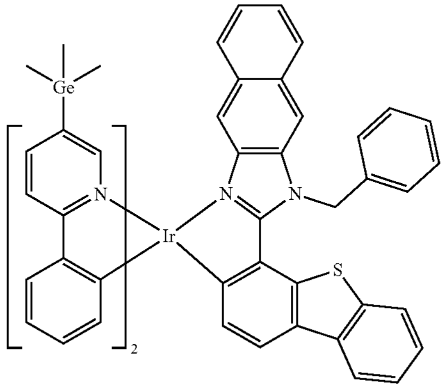
3013
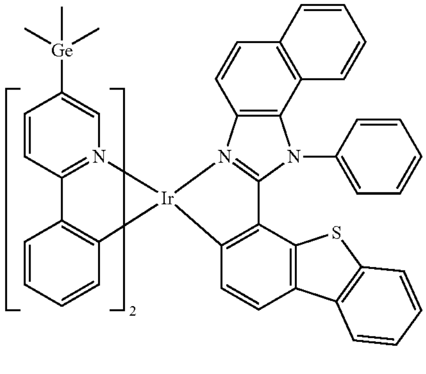

-continued
3014
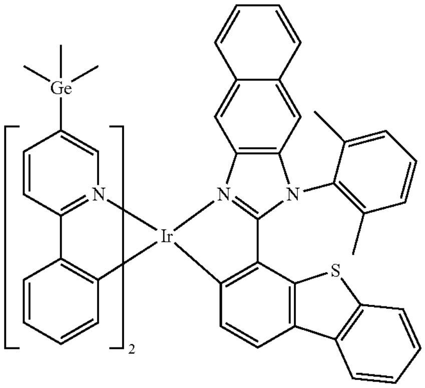
3015
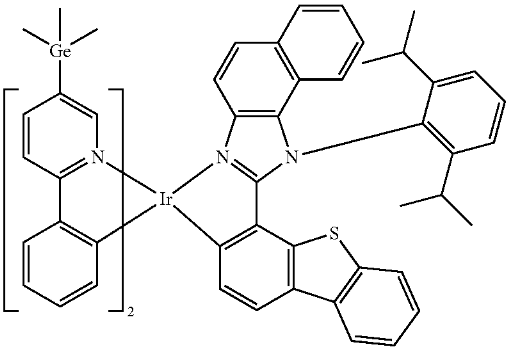
3016
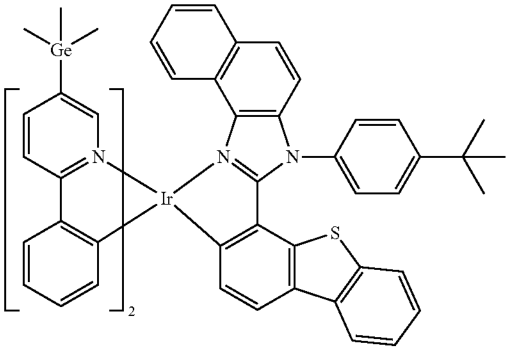
3017
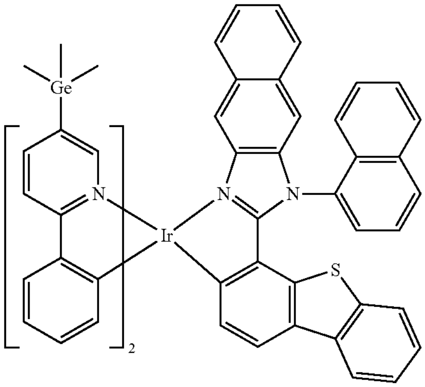
-continued
3018
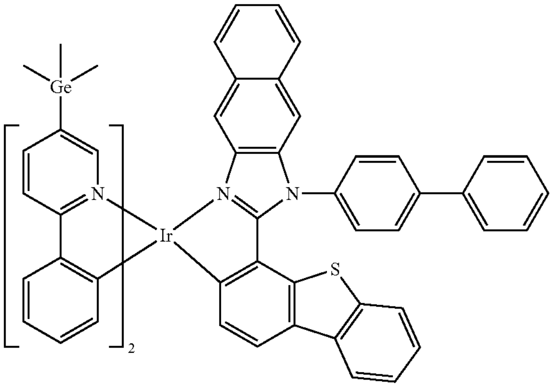
3019
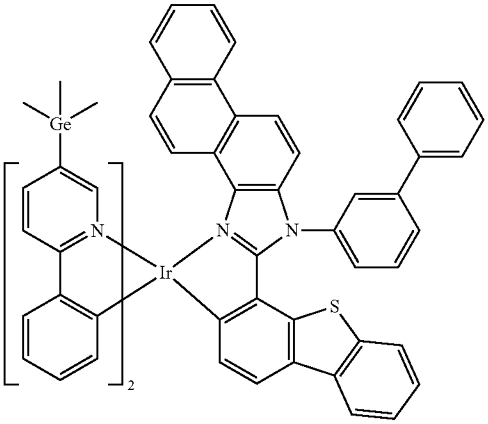
3020
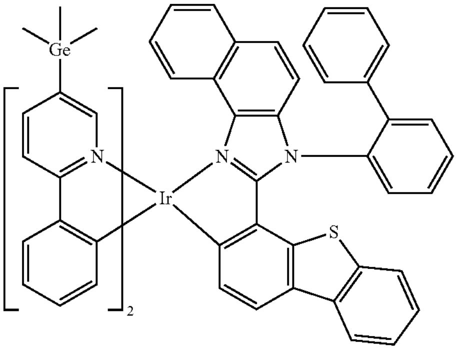
3021
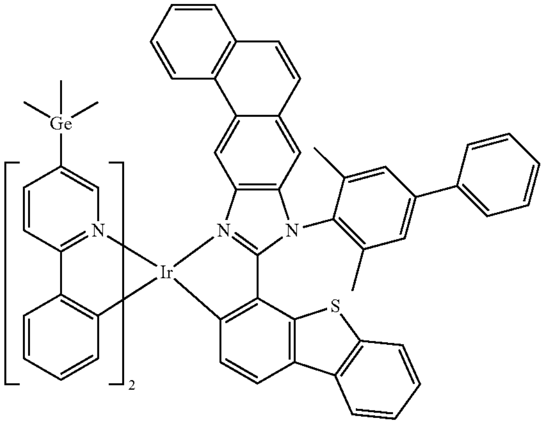

-continued
3022
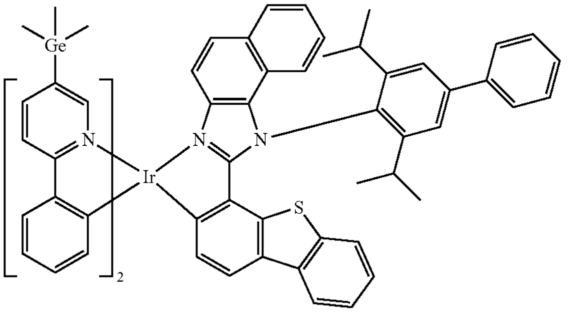
3023
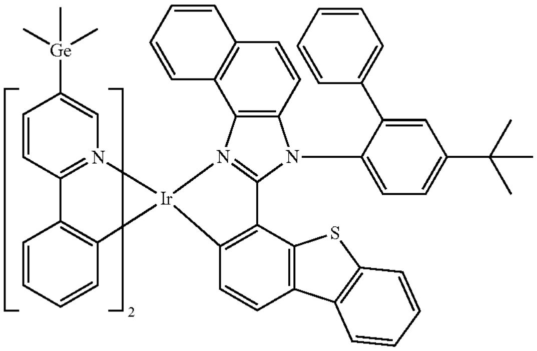
3024
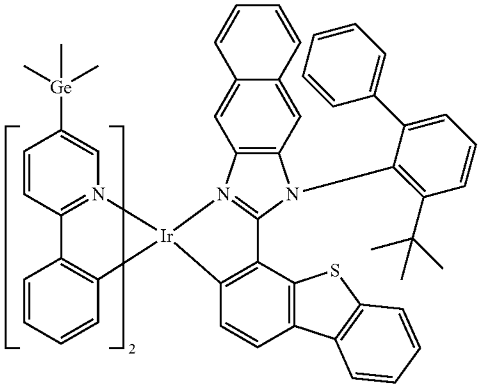
3025
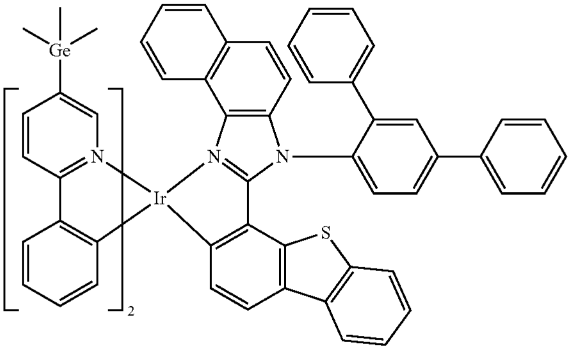
-continued
3026
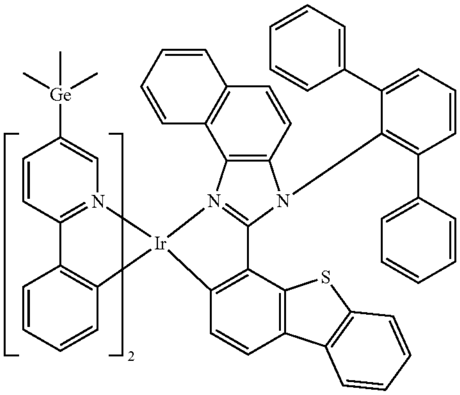
3027
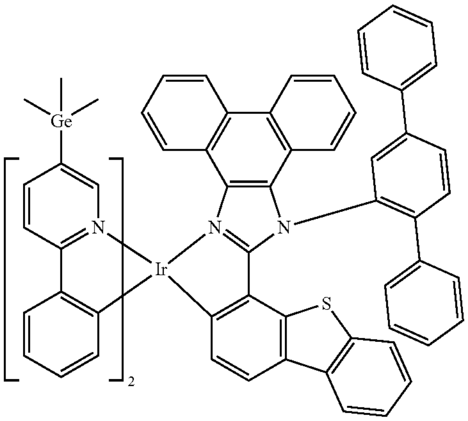
3028
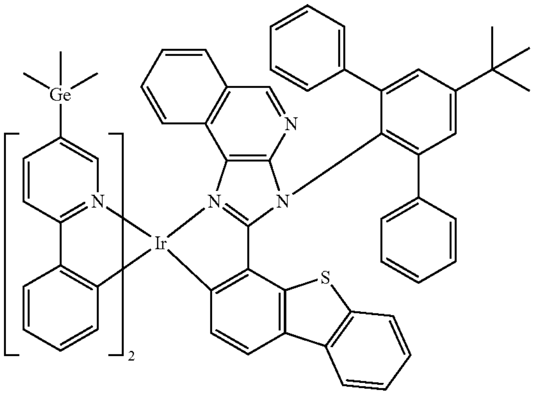
3029
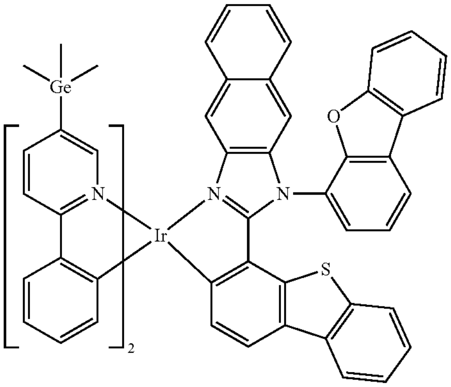

-continued
3030
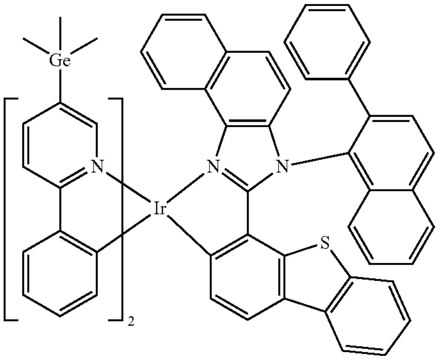
3031
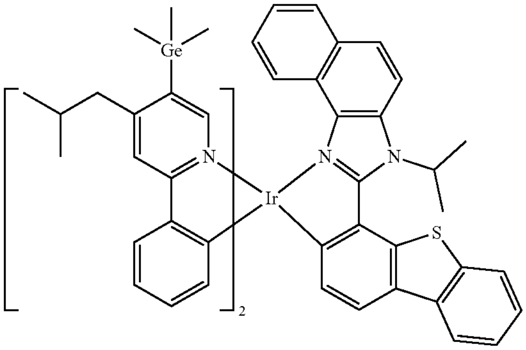
3032
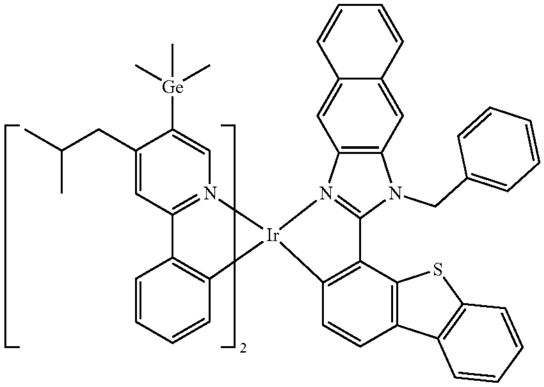
3033
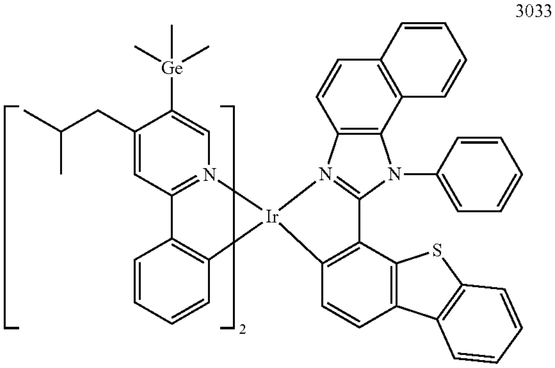
-continued
3034
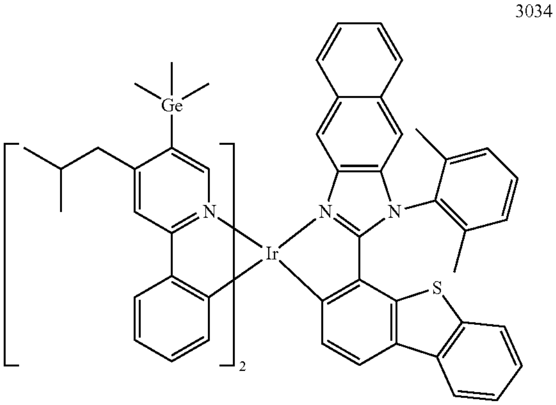
3035
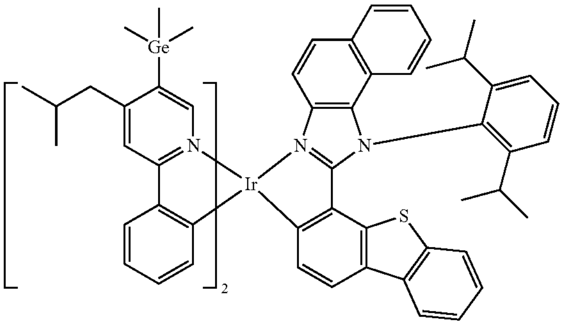
3036
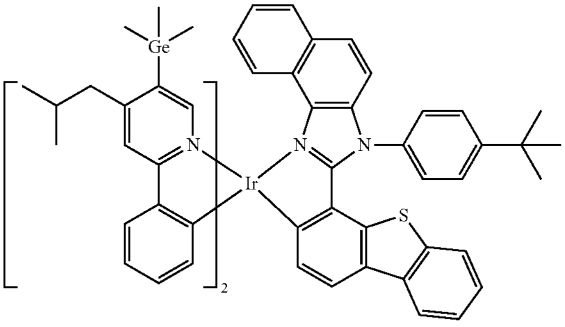
3037
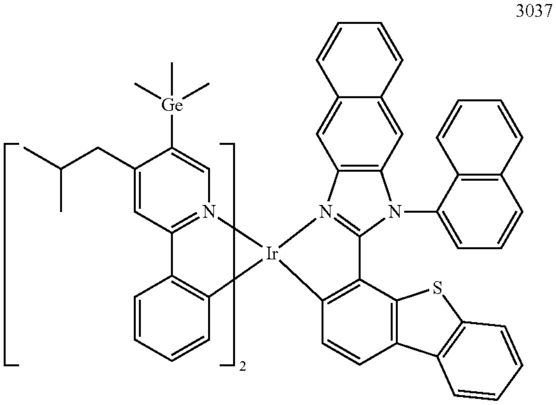

-continued
3038
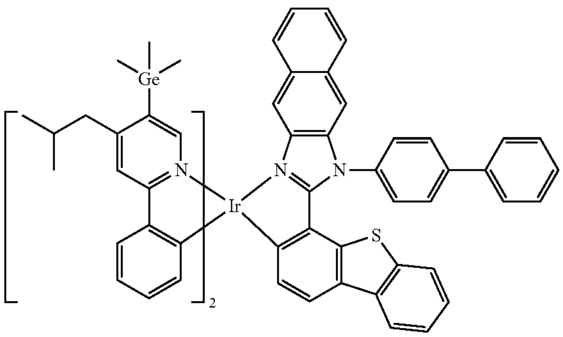
3039
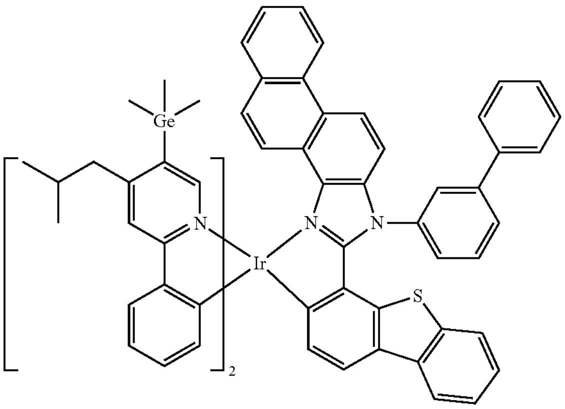
3040
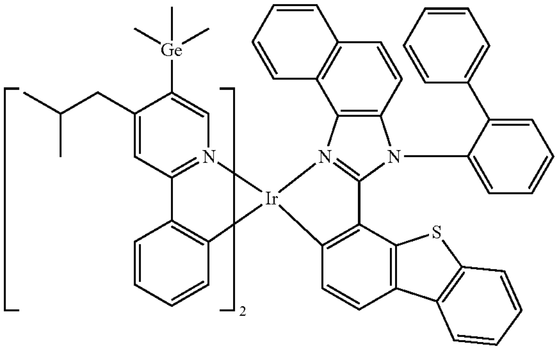
3041
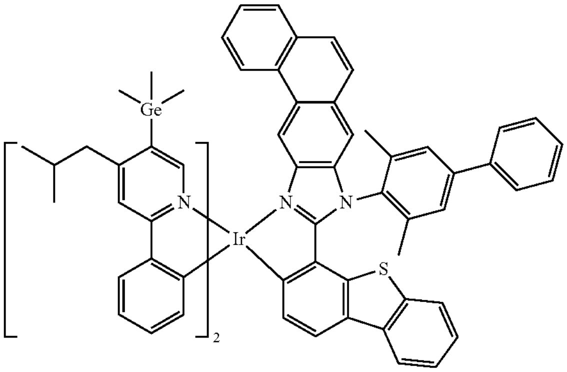
-continued
3042
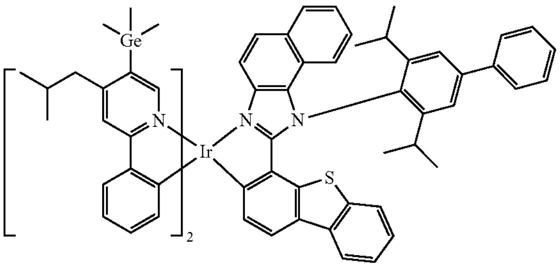
3043
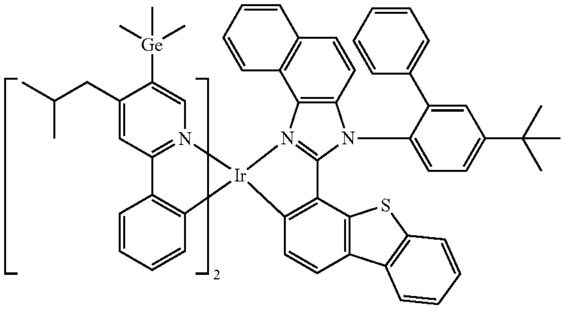
3044
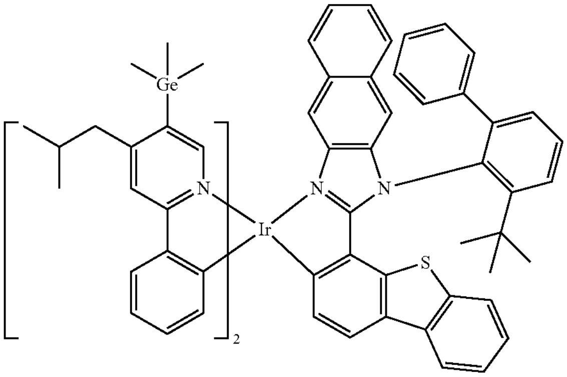
3045
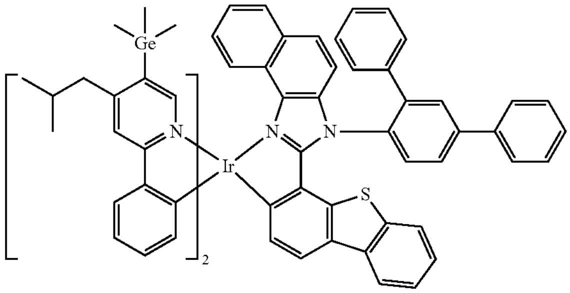

-continued
3046
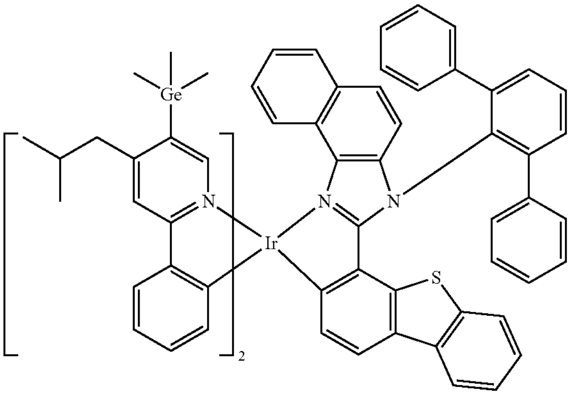
3047
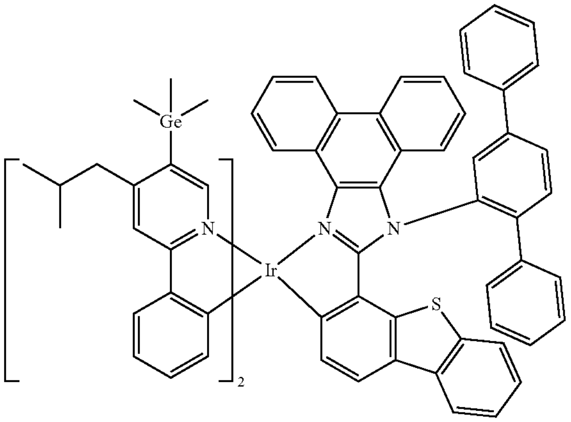
3048
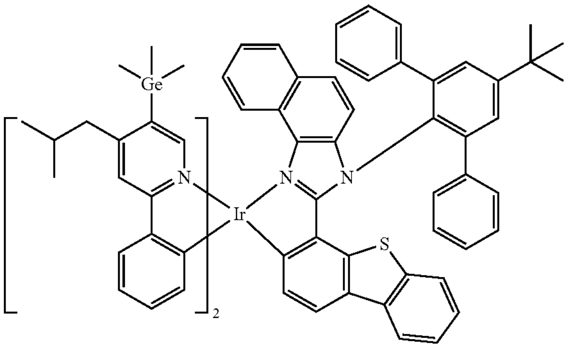
3049
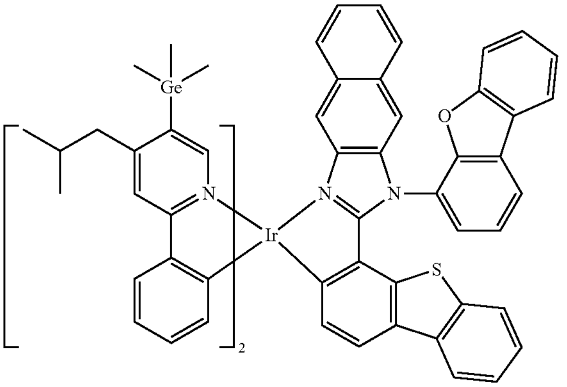
-continued
3050
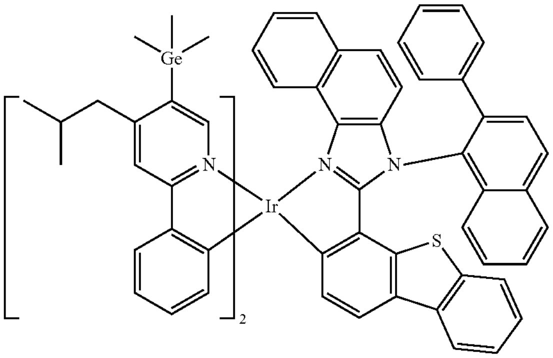
3051
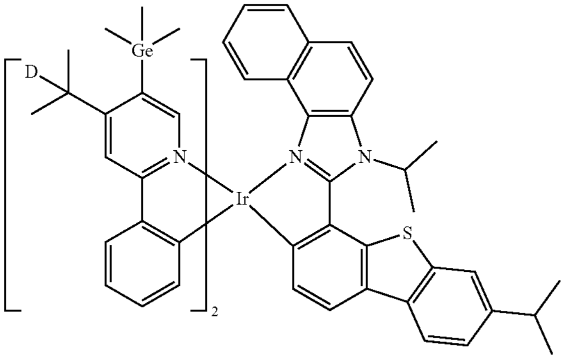
3052
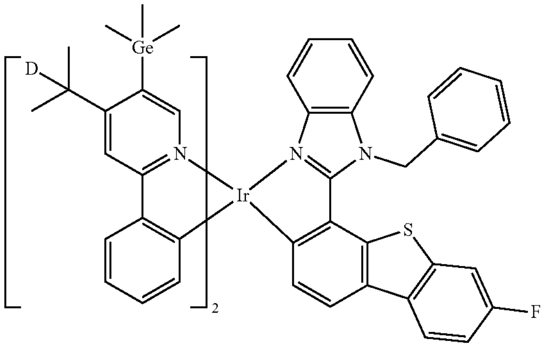
3053
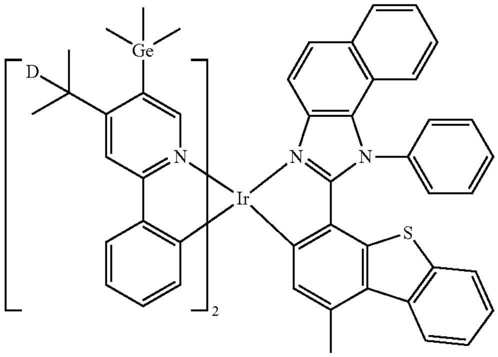

-continued
3054
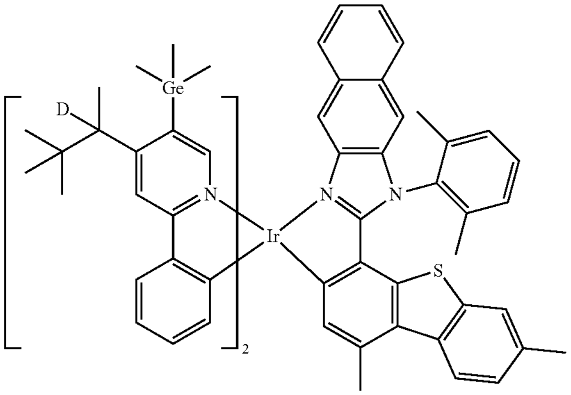
3055
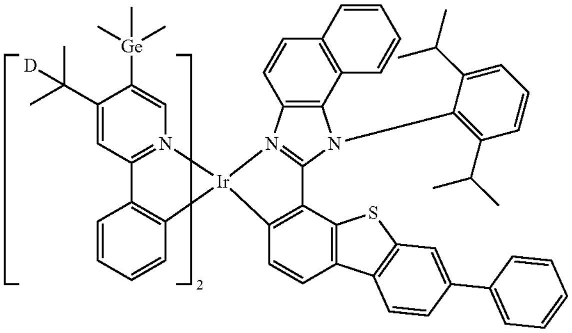
3056
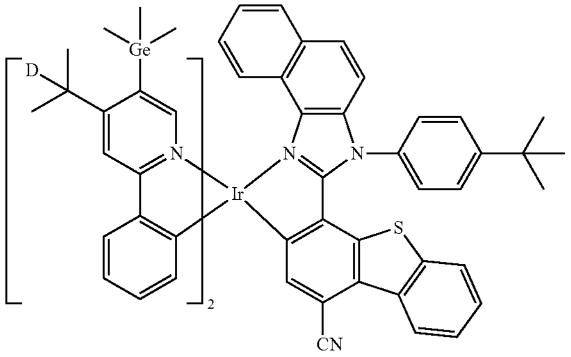
3057
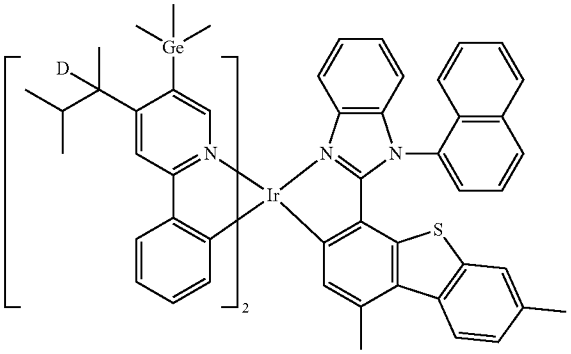
-continued
3058
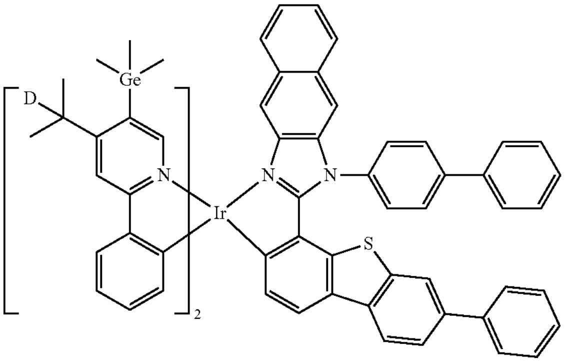
3059
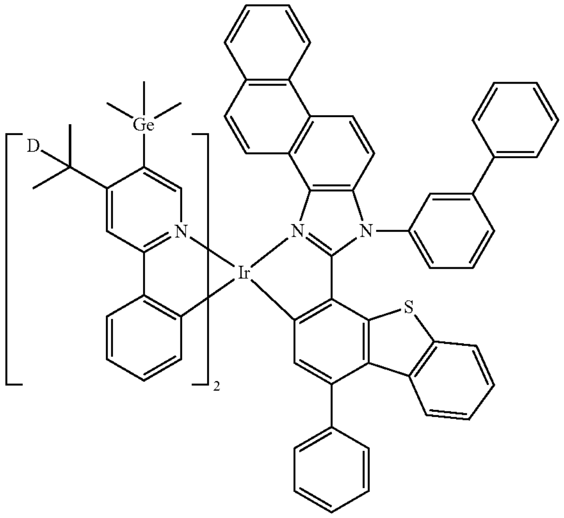
3060
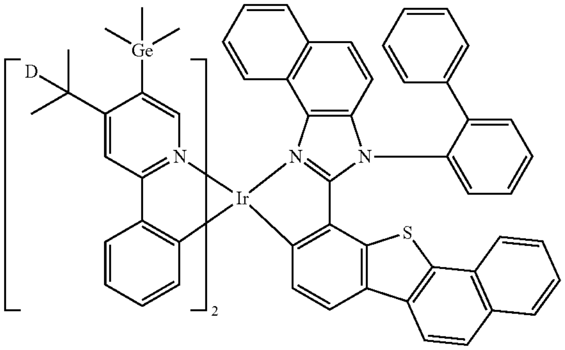

3061
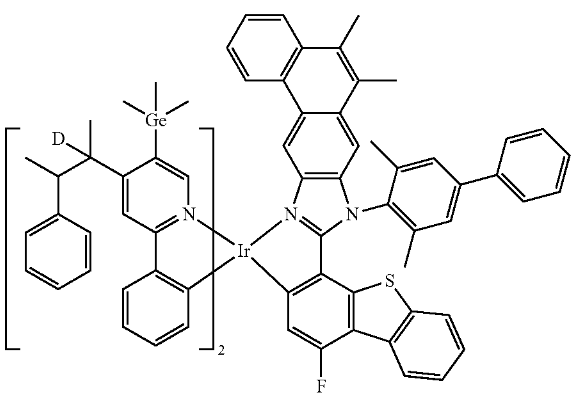
3062
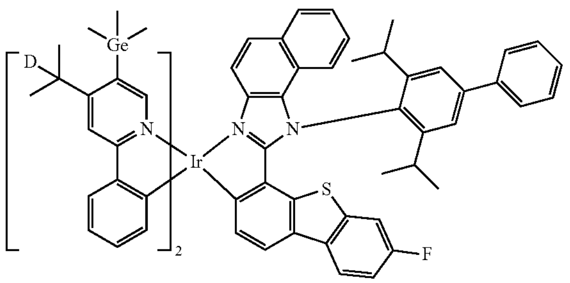
3063
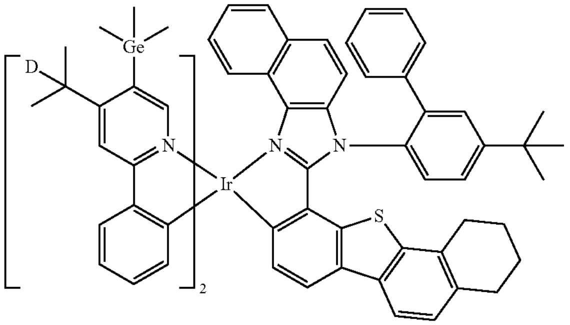
3064
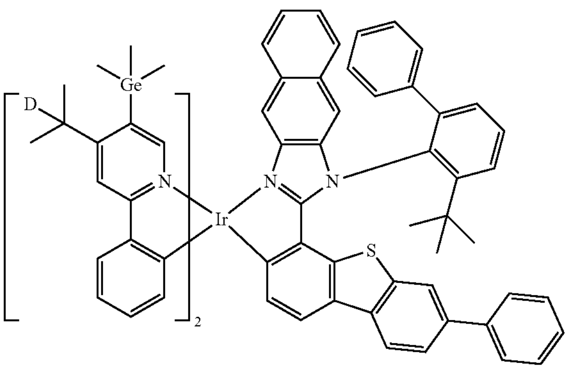
3065
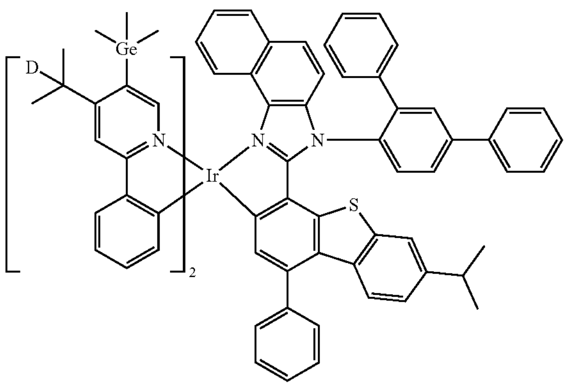
3066
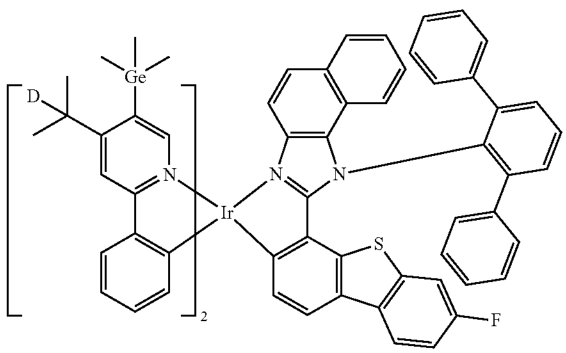
3067
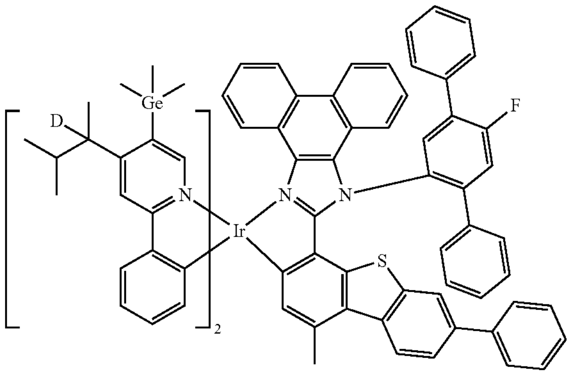
3068
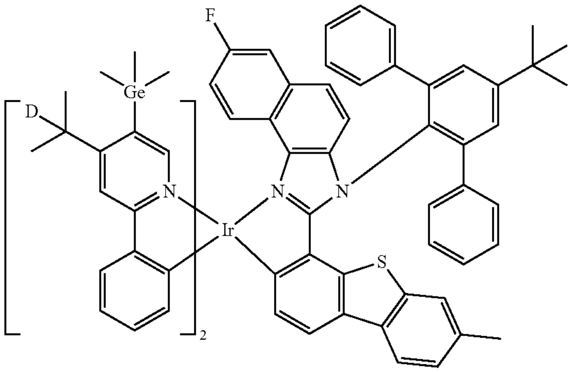

-continued
3069
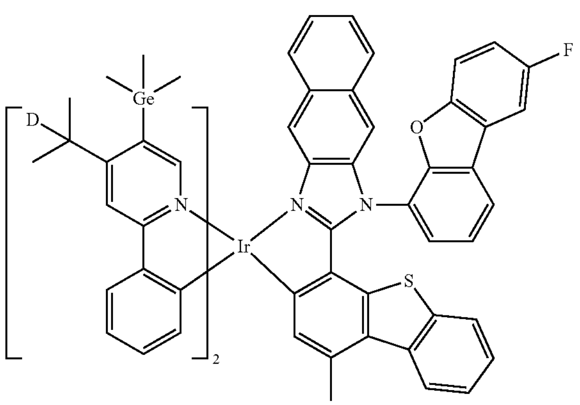
3070
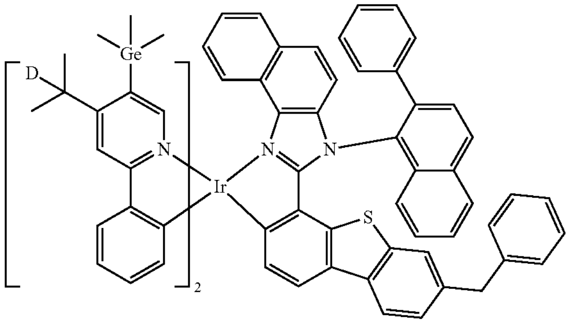
3071
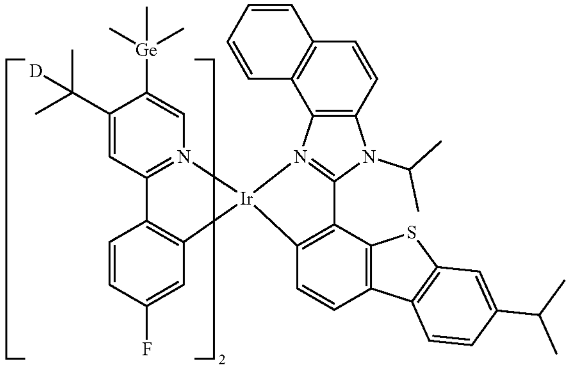
3072
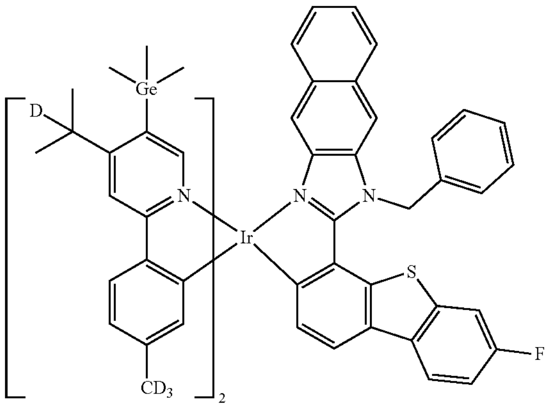
-continued
3073
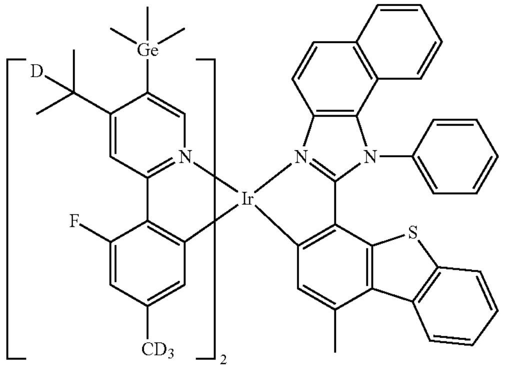
3074
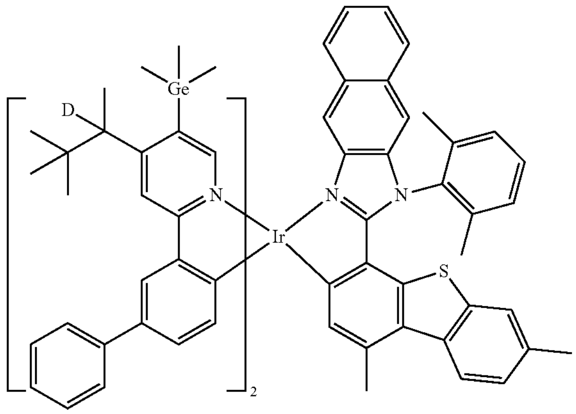
3075
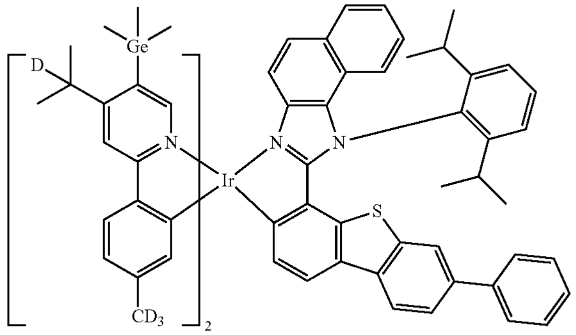
3076
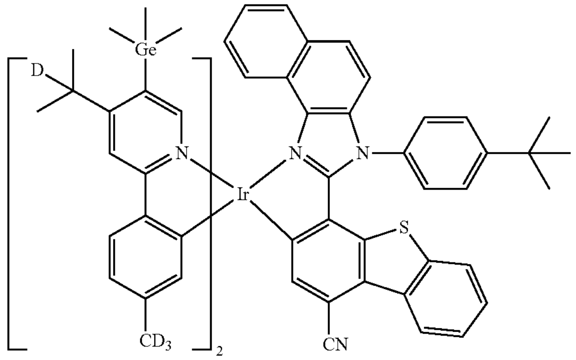

3077
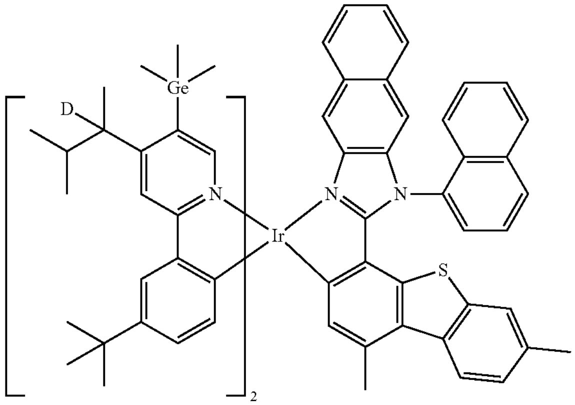
3078
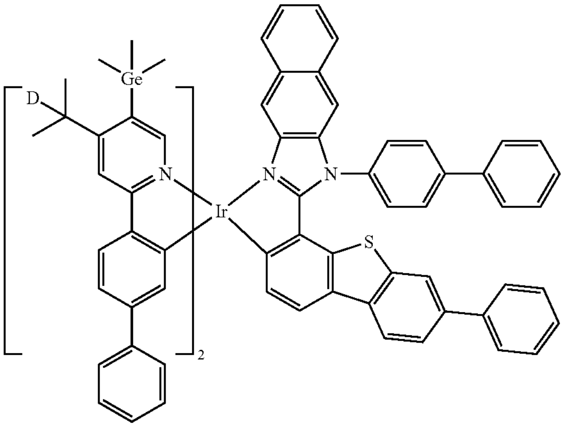
3079
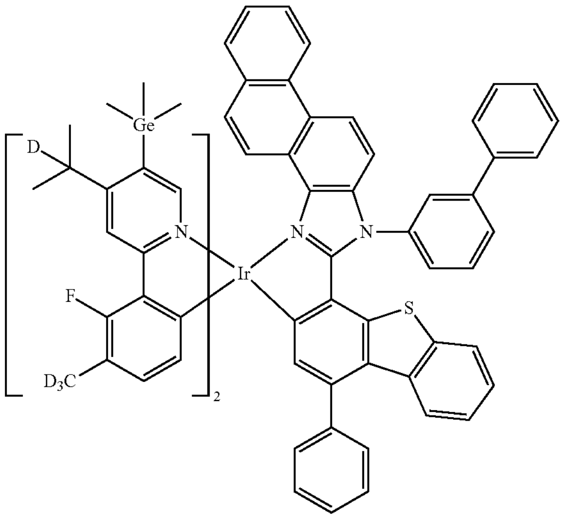
3080
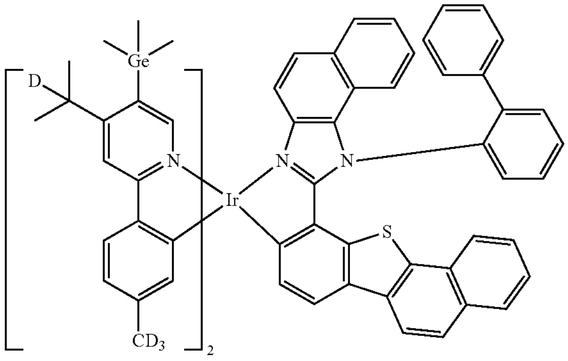
3081
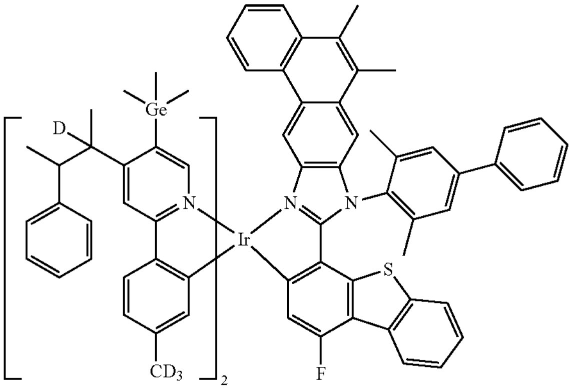
3082
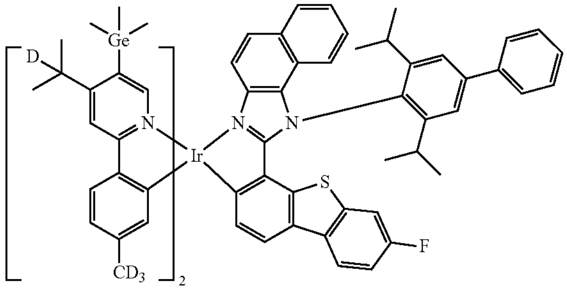
3083
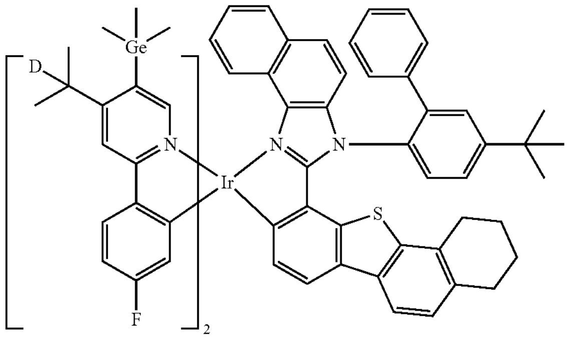

-continued
3084
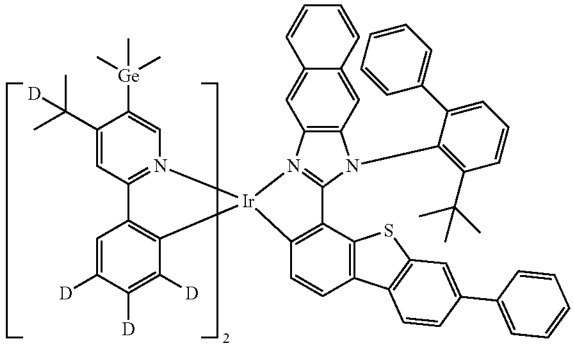
3085
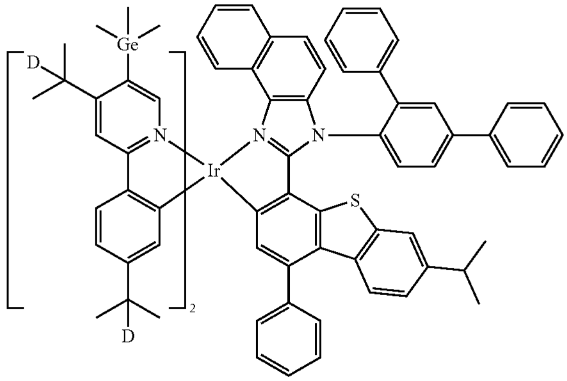
3086
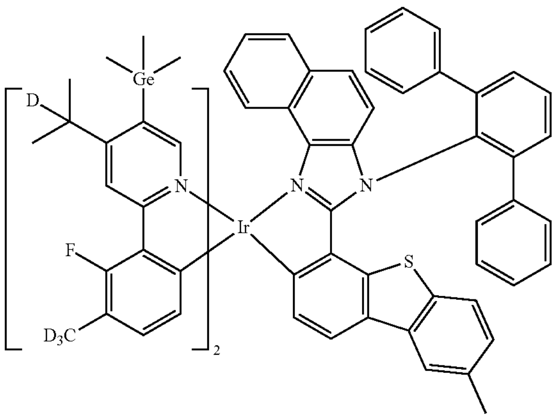
3087
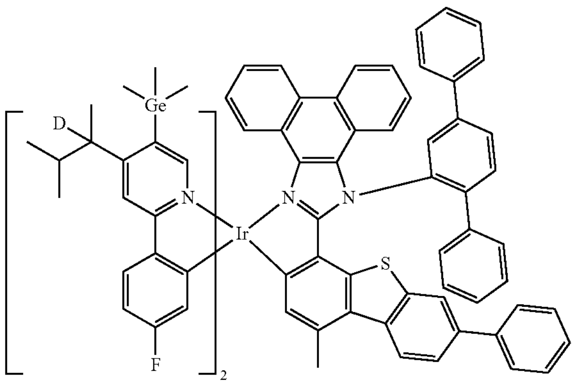
-continued
3088
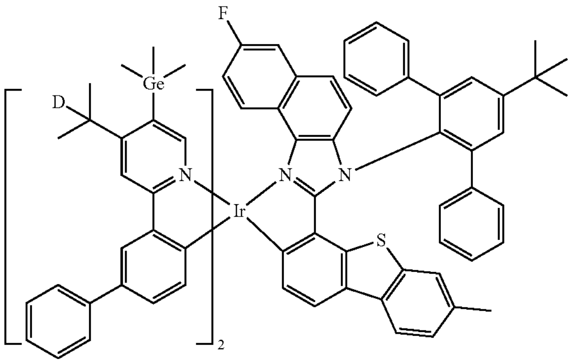
3089
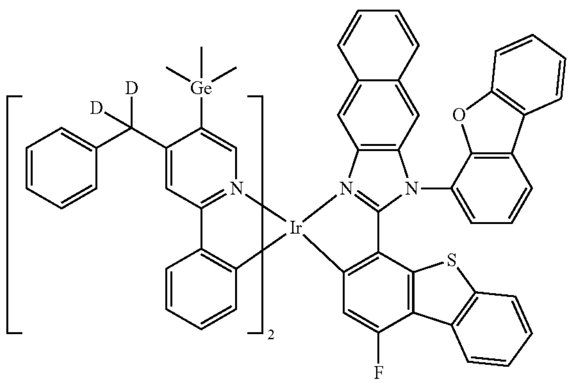
3090
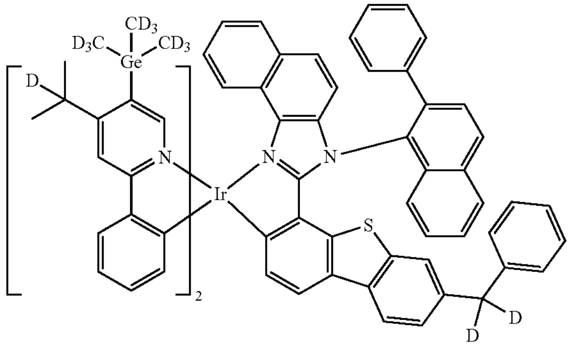
3091
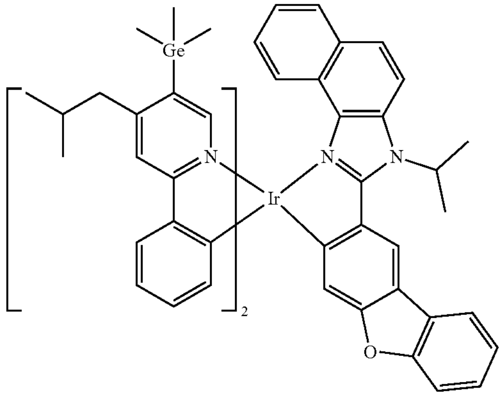

-continued
3092
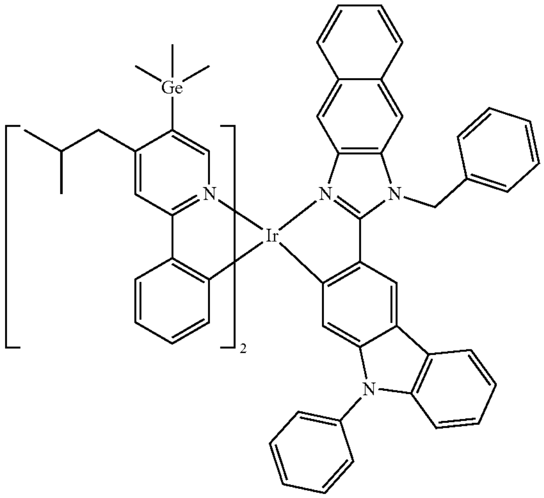
3093
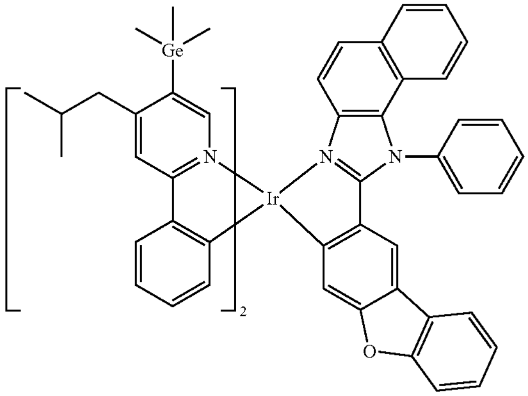
3094
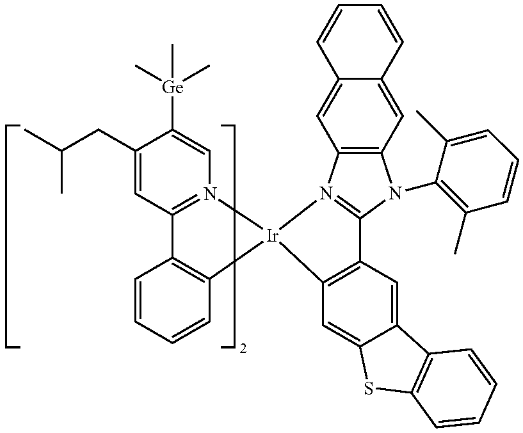
-continued
3095
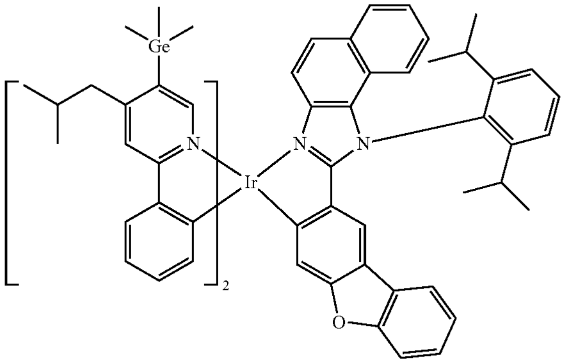
3096
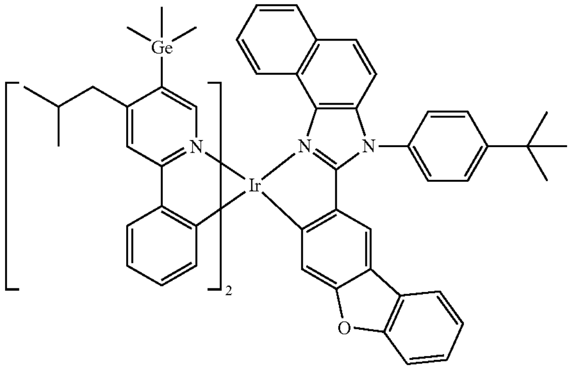
3097
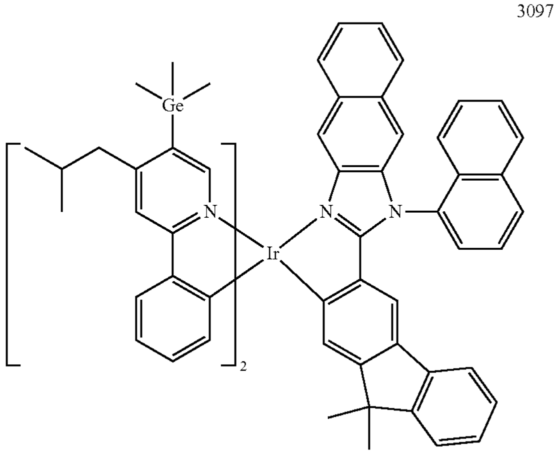
3098
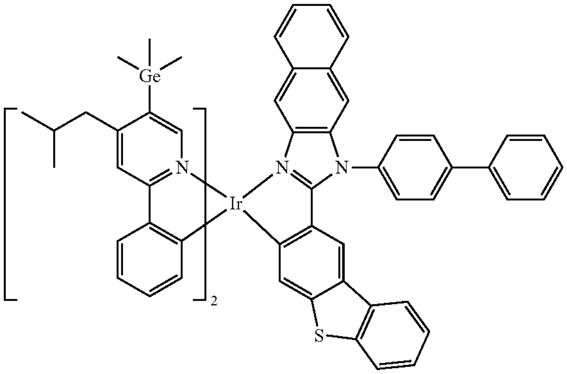

-continued
3099
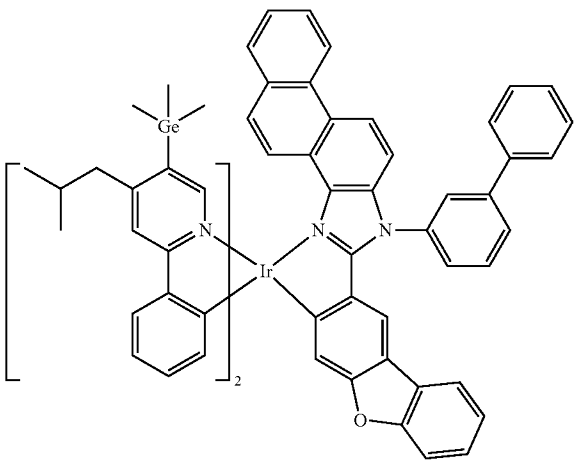
3100
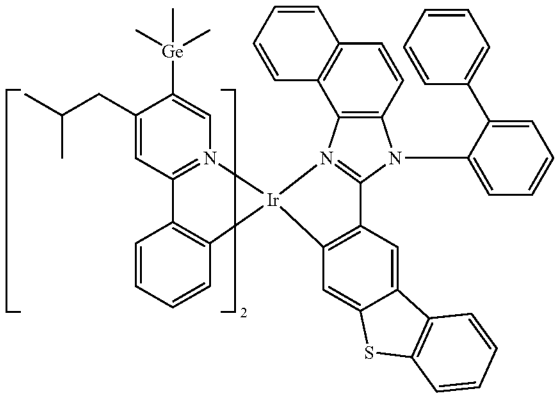
3101
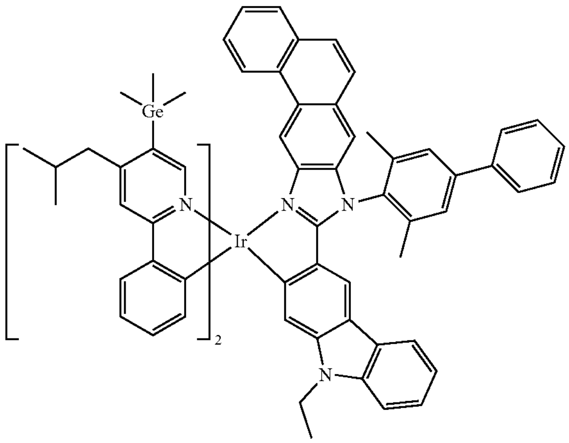
-continued
3102
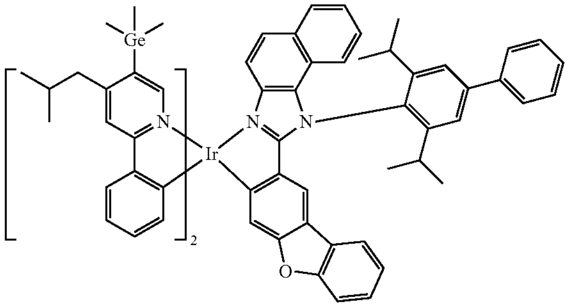
3103
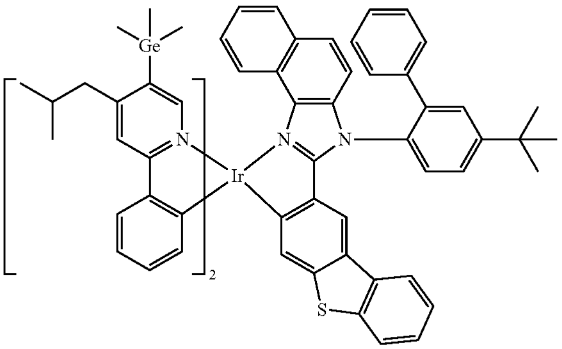
3104
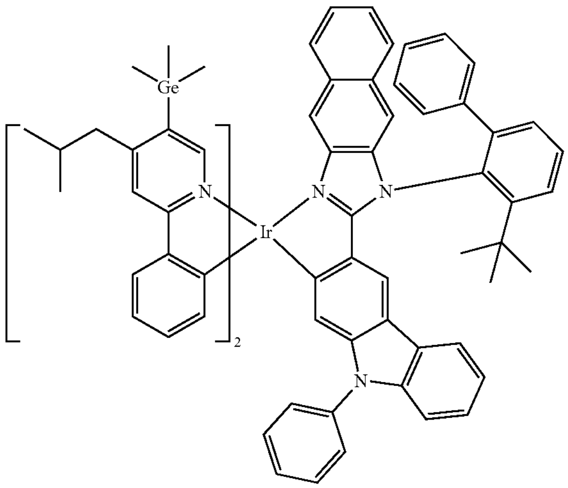
3105
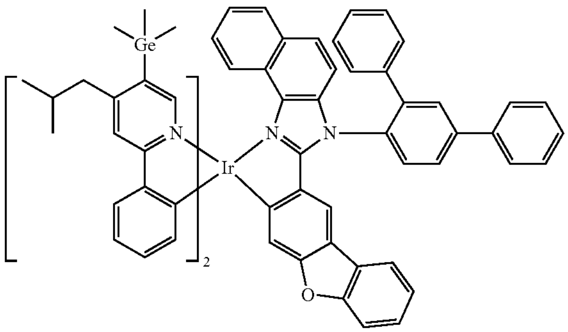

-continued
3106
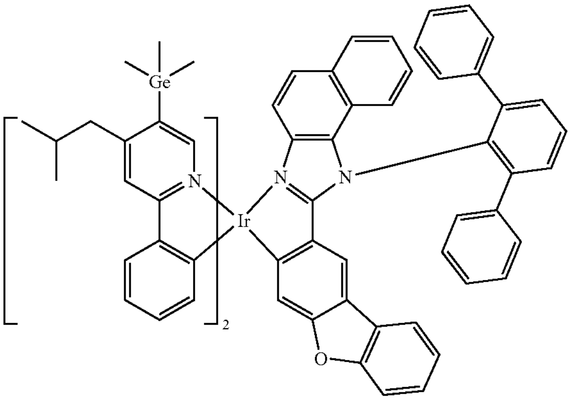
3107
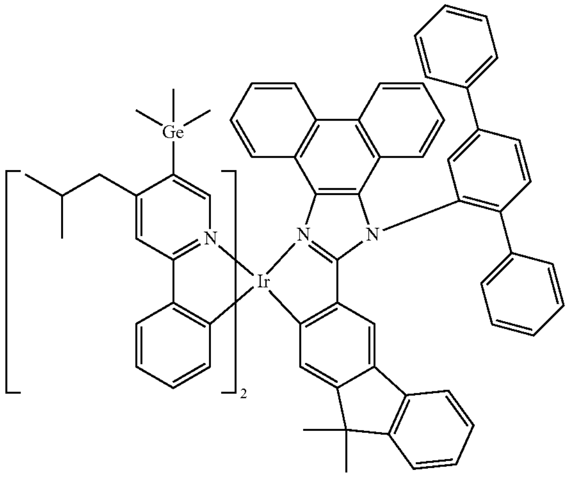
3108
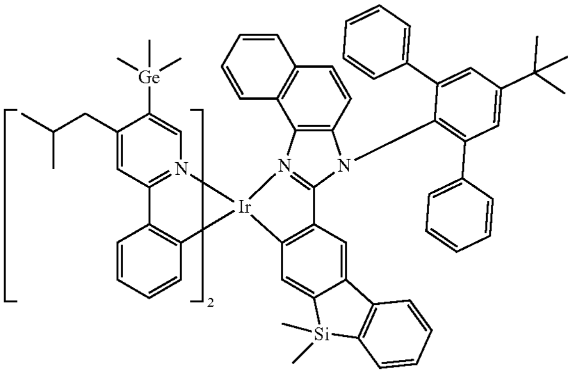
3109
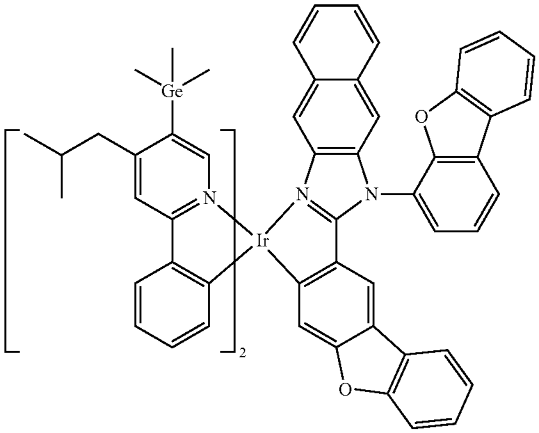
3110
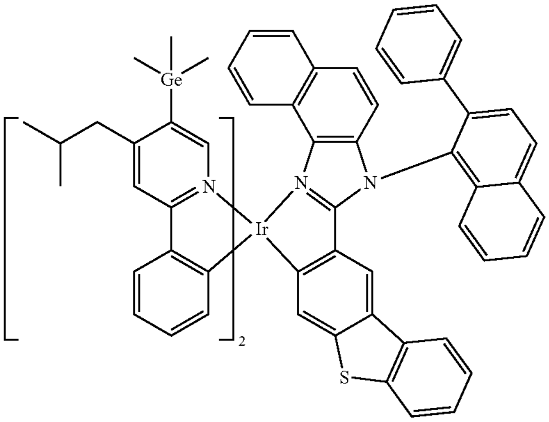
3111
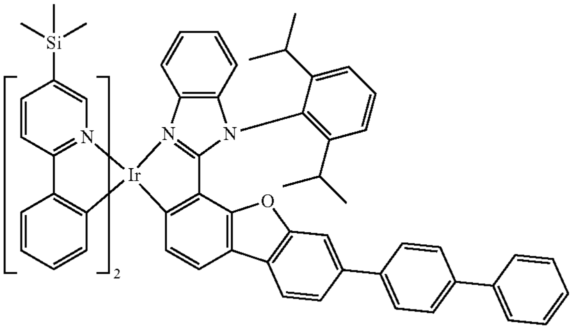

-continued
3112
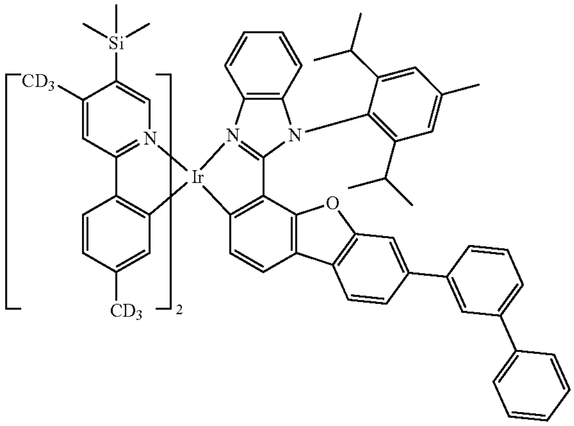
3113
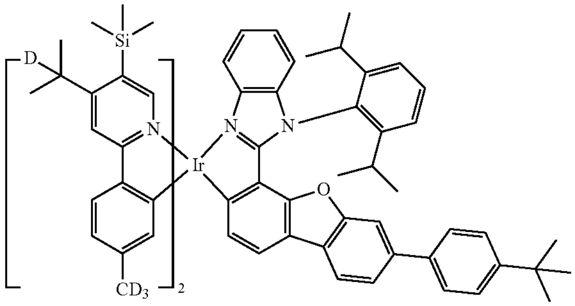
3114
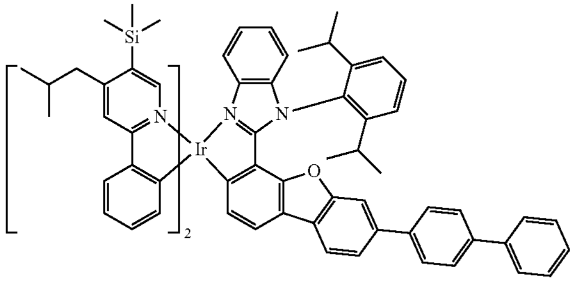
3115
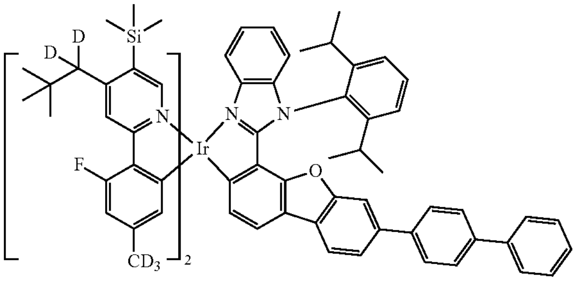
-continued
3116
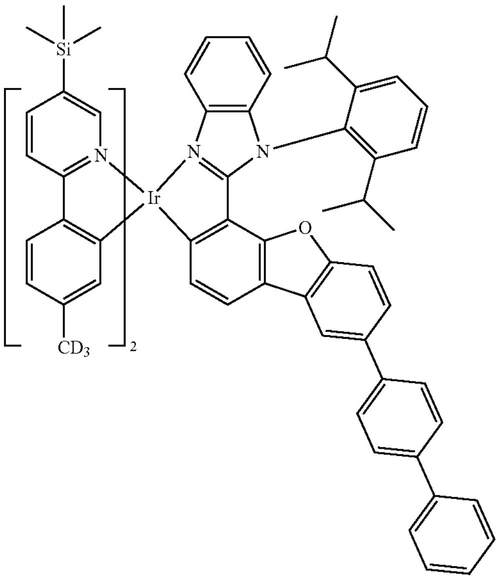
3117
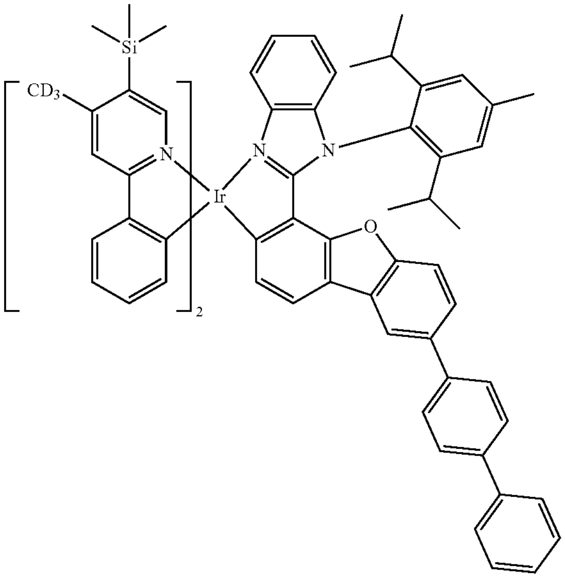
3118
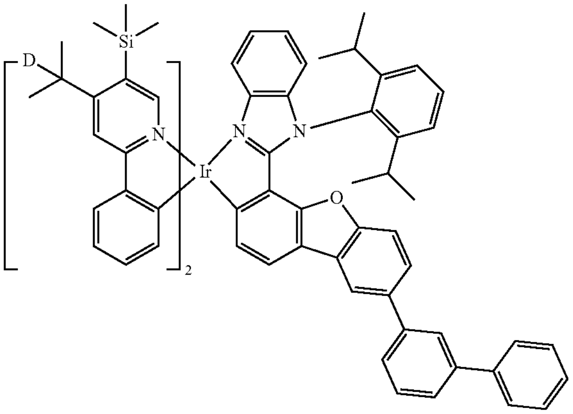

-continued
3119
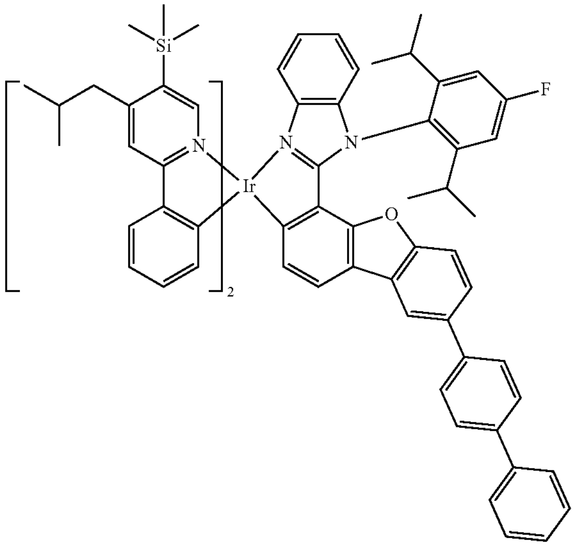
3120
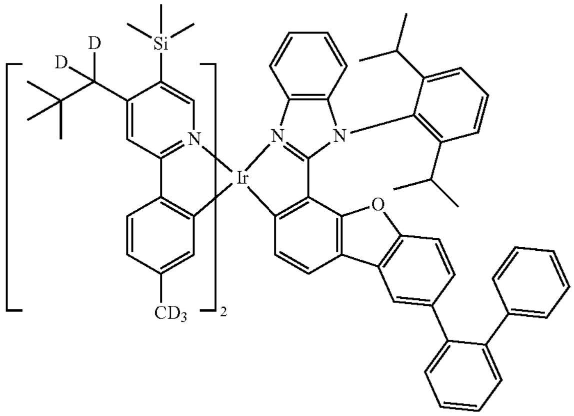
3121
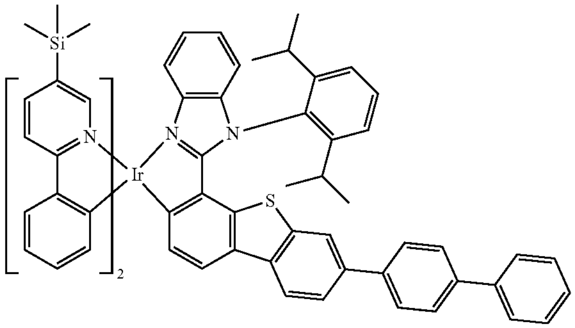
-continued
3122
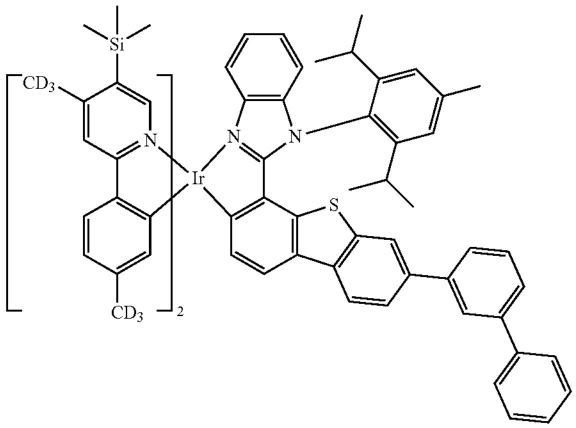
3123
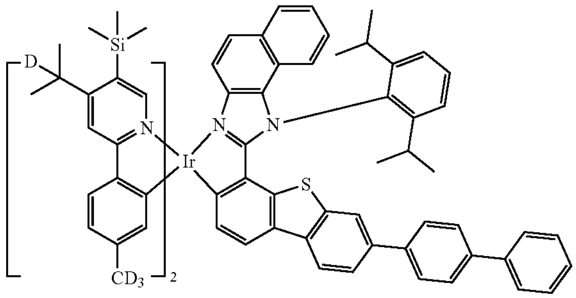
3124
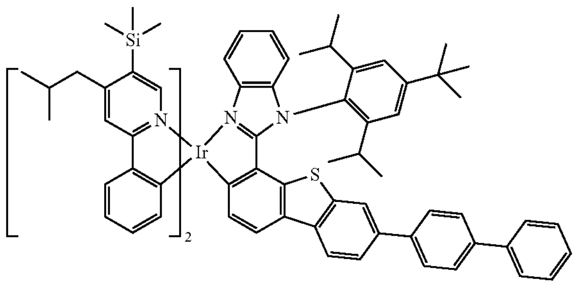
3125
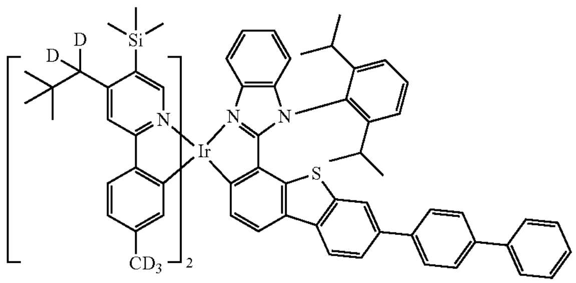

-continued
3126
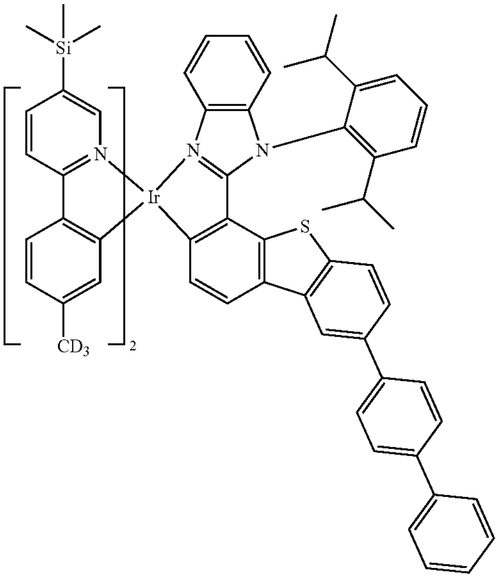
3127
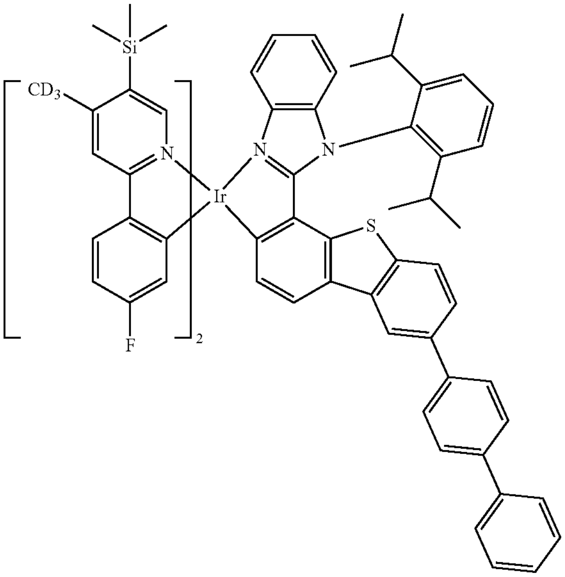
3128
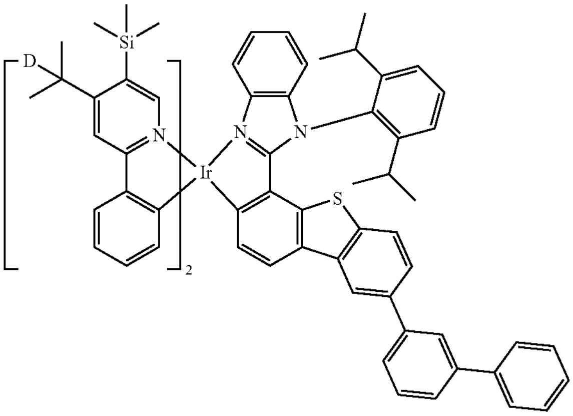
-continued
3129
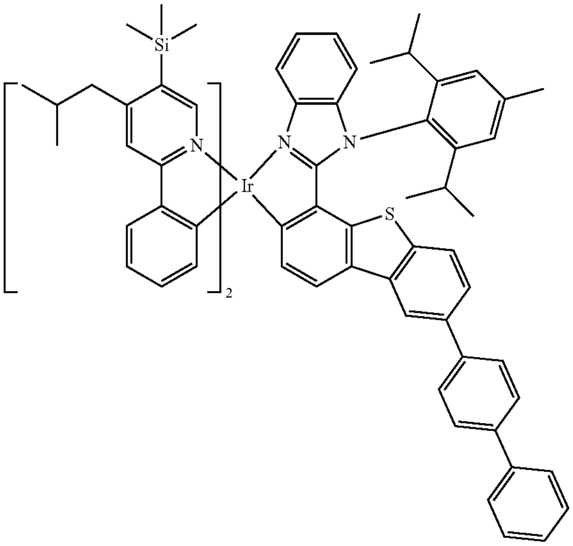
3130
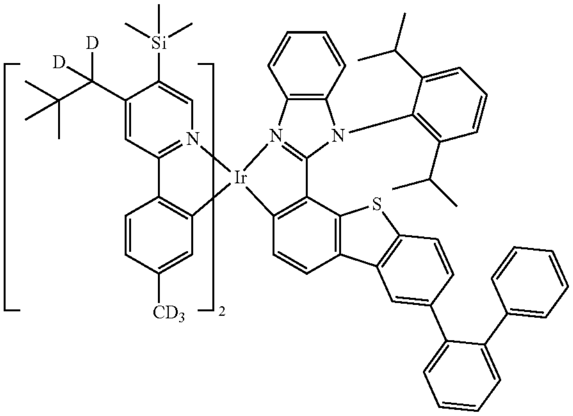
3131
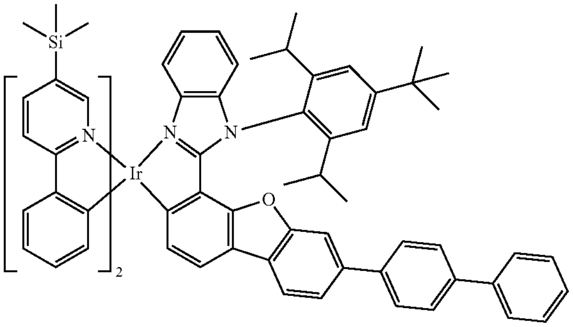

-continued
3132
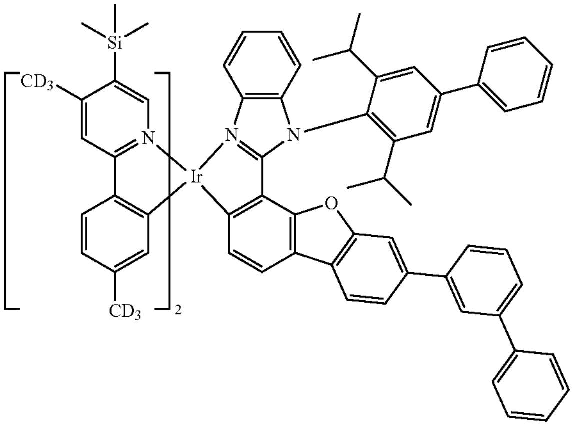
3133
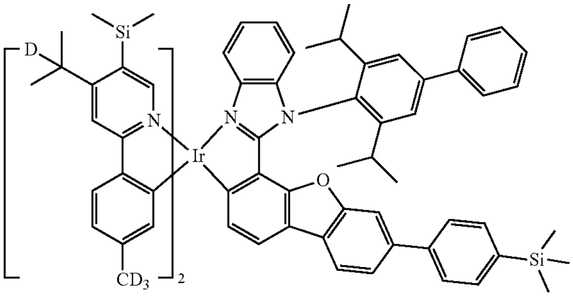
3134
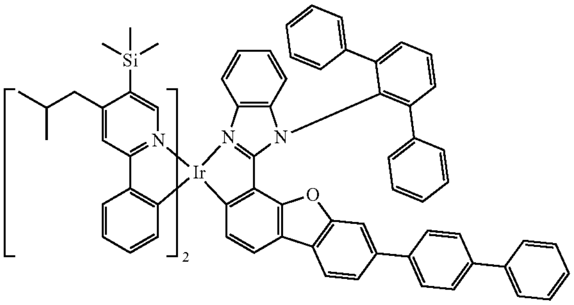
3135
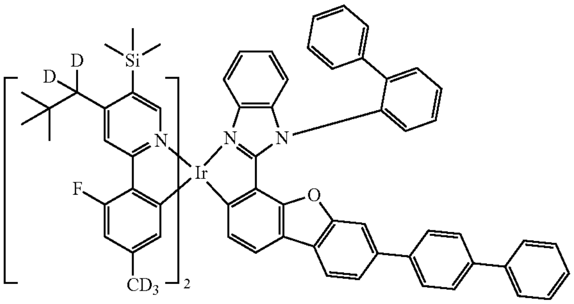
-continued
3136
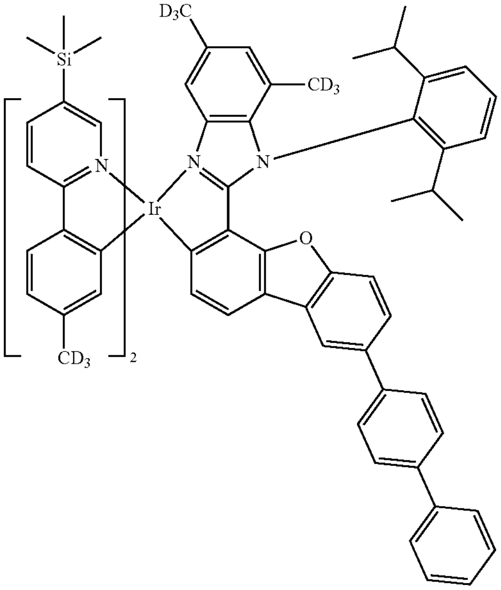
3137
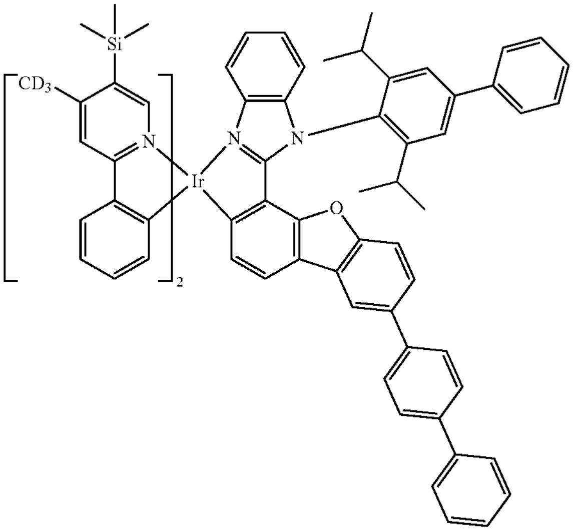
3138
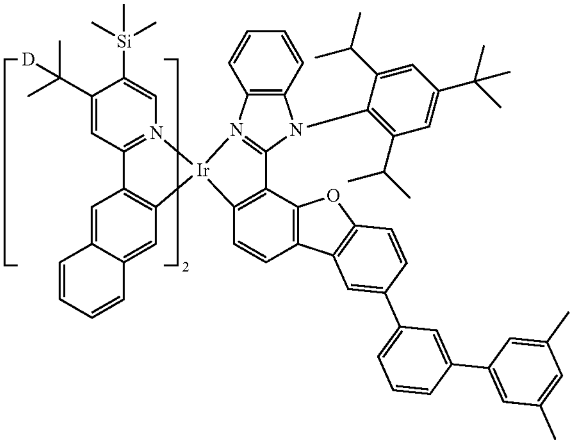

-continued
3139
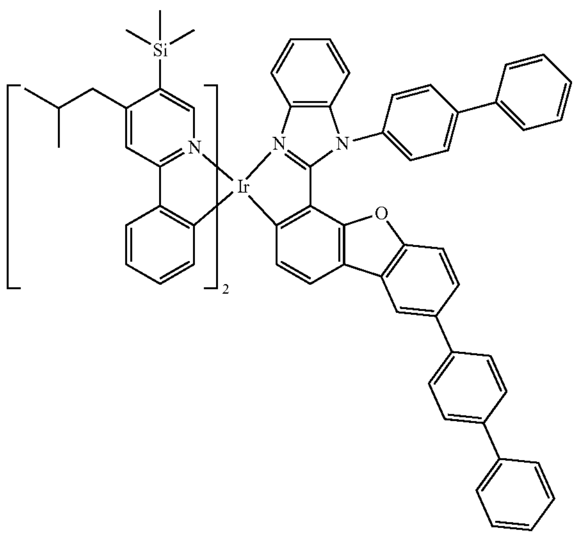
3140
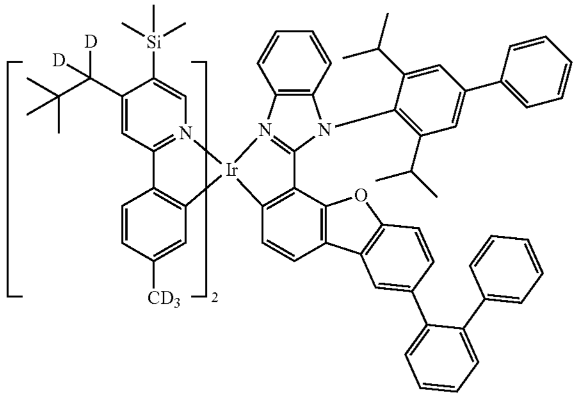
3141
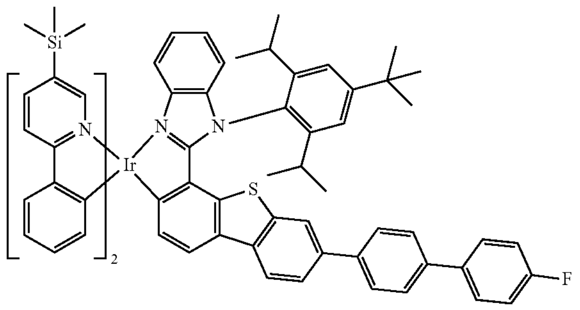
-continued
3142
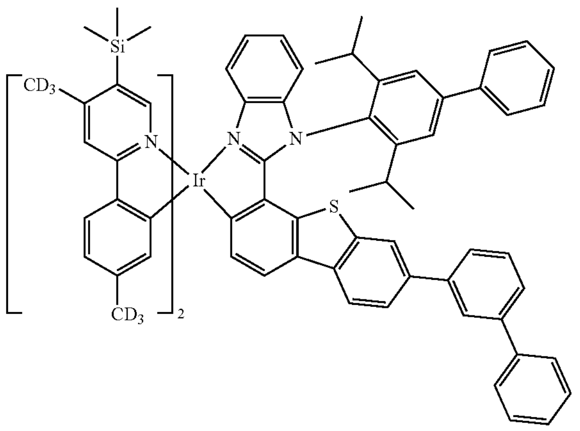
3143
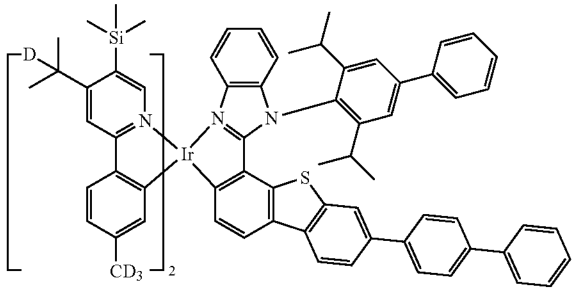
3144
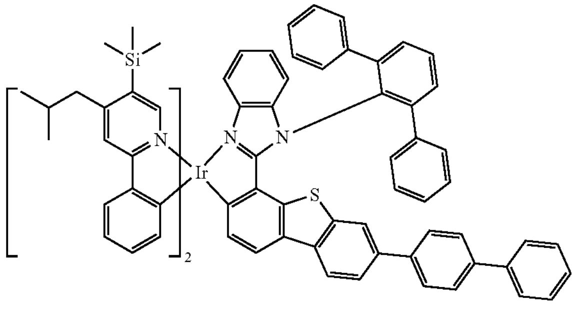
3145
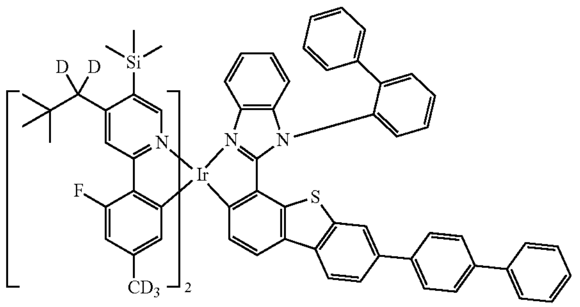

3146
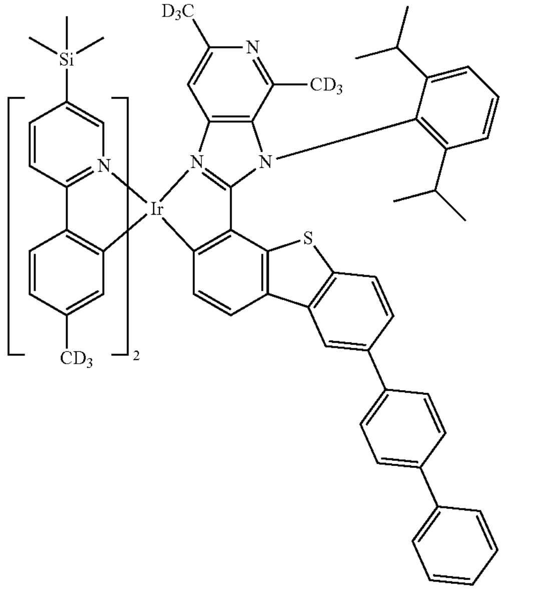
3147
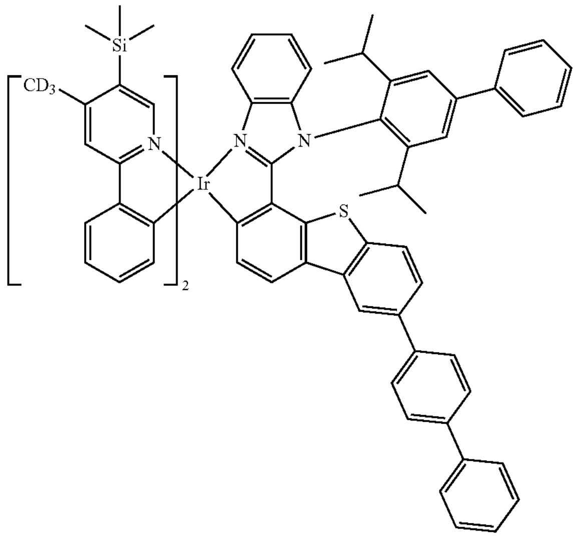
3148
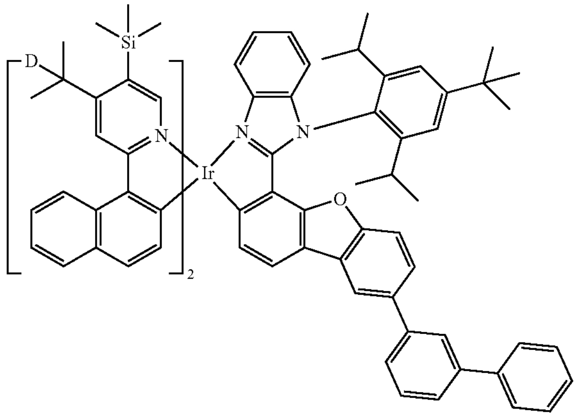
3149
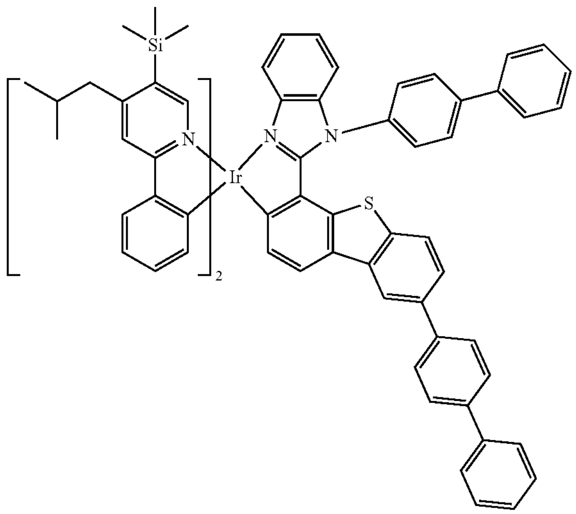
3150
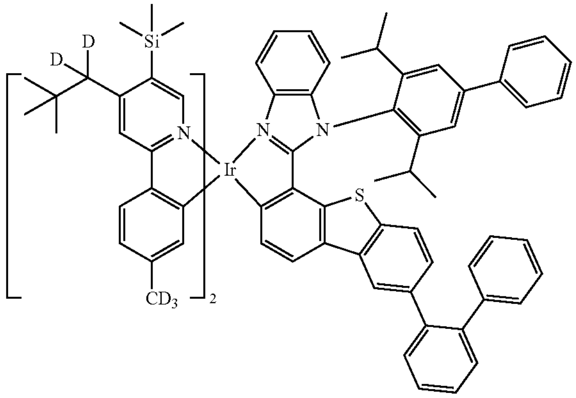
3151
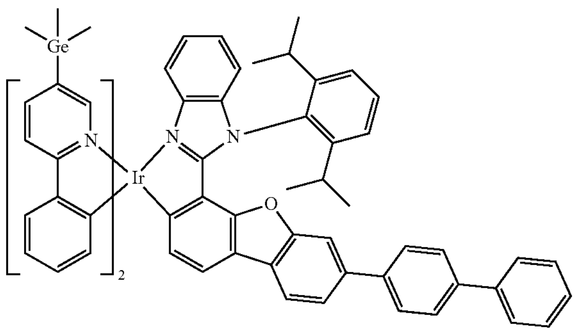

-continued
3152
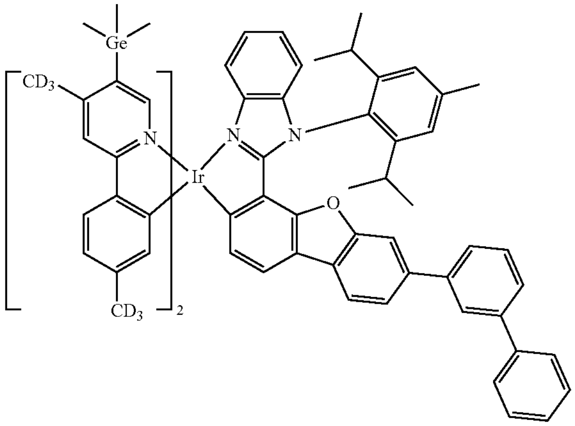
3153
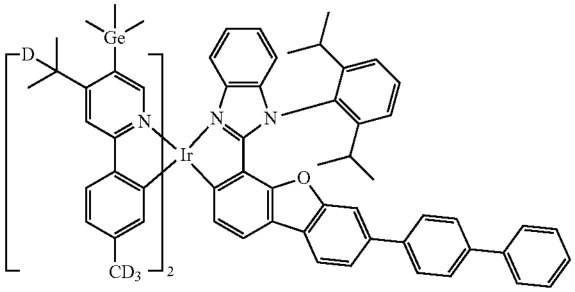
3154
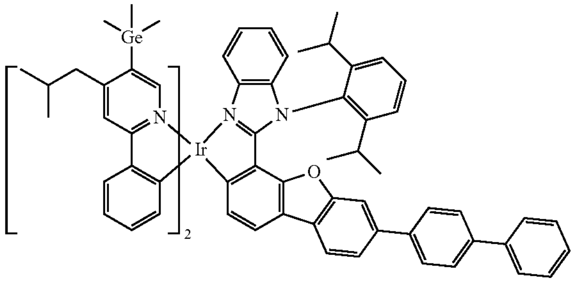
3155
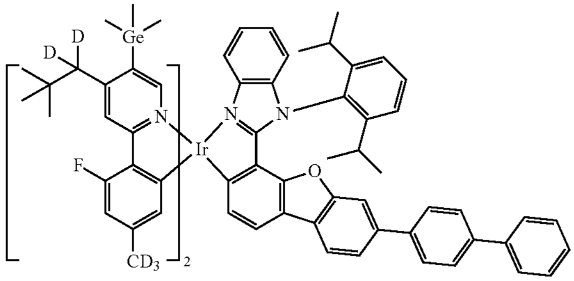
-continued
3156
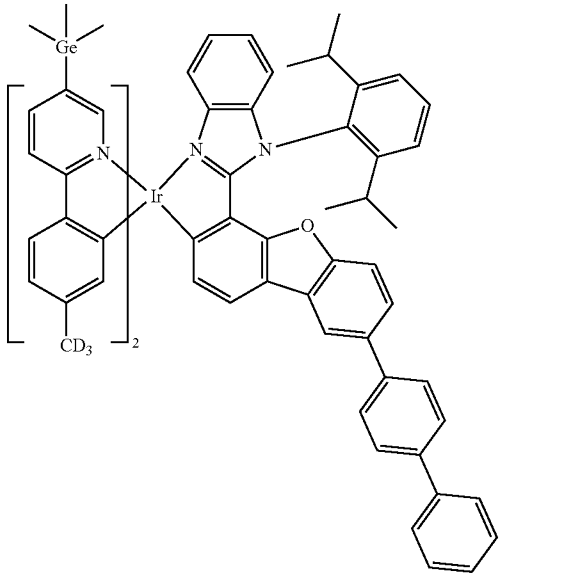
3157
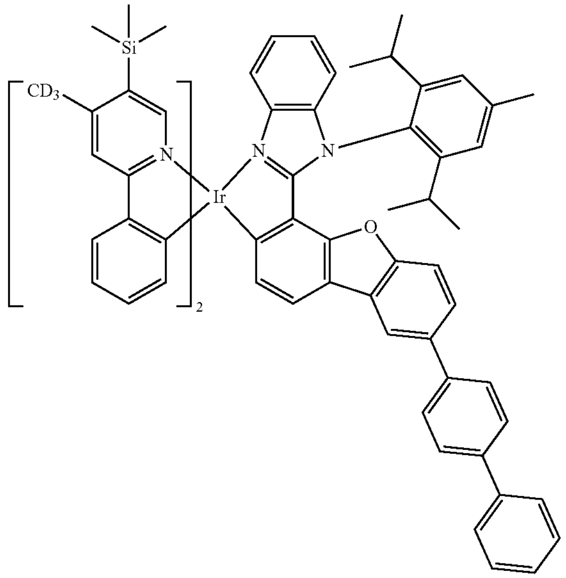
3158
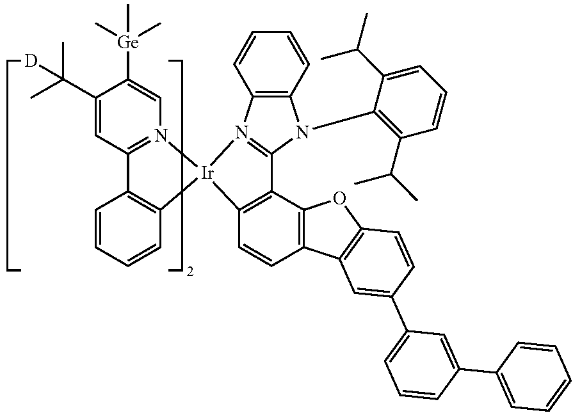

-continued
3159
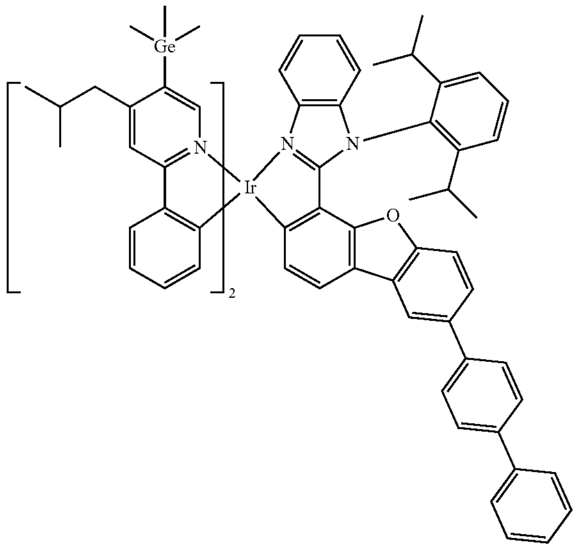
3160
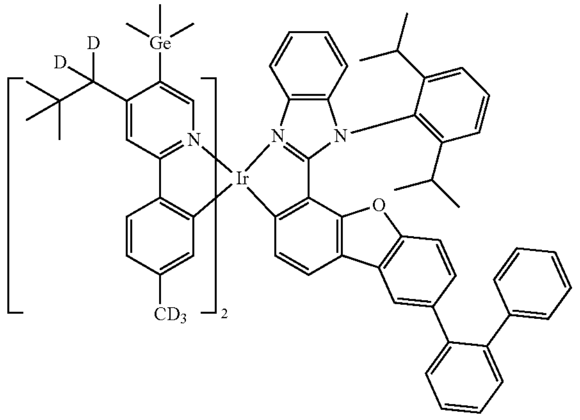
3161
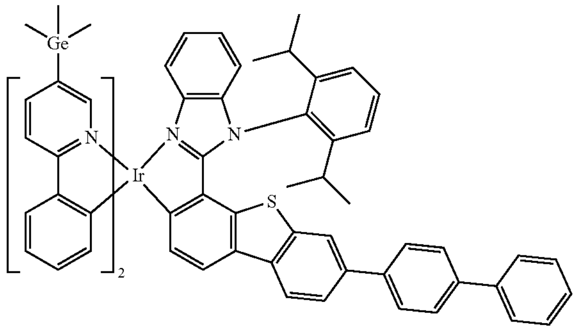
-continued
3162
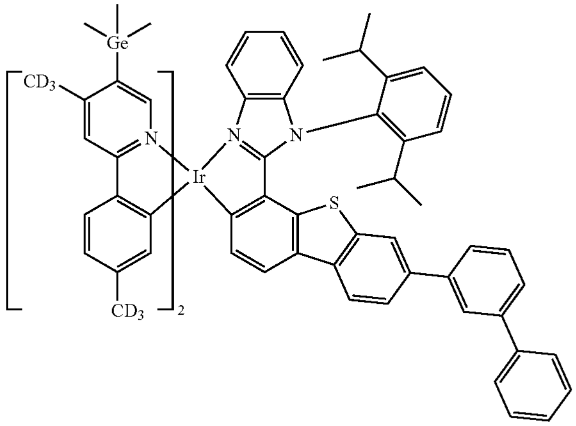
3163
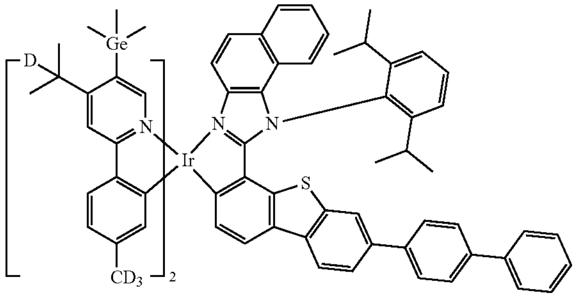
3164
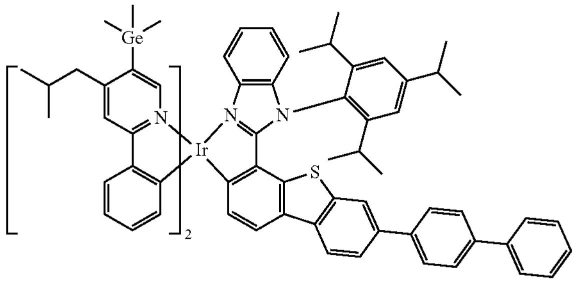
3165
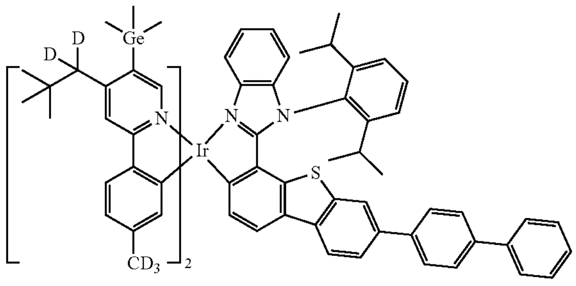

-continued
3166
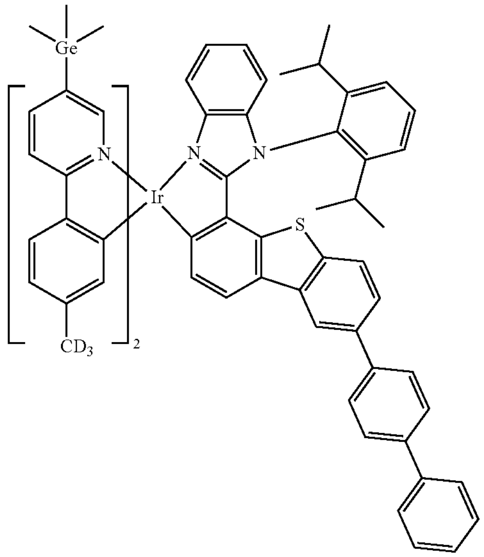
3167
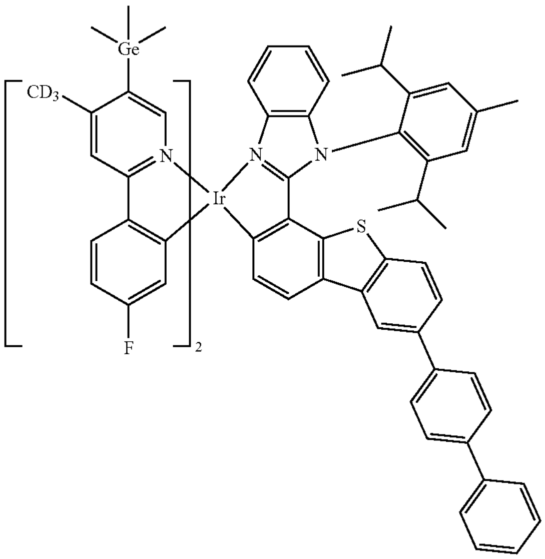
3168
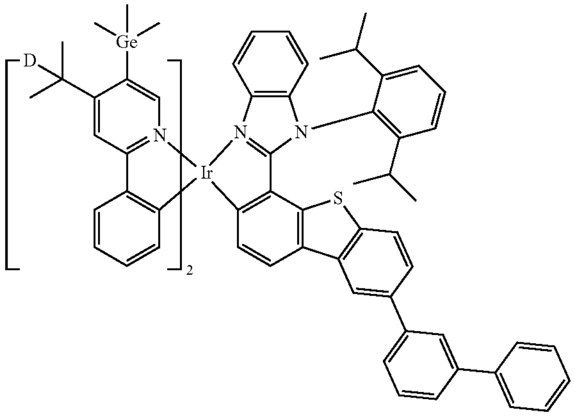
-continued
3169
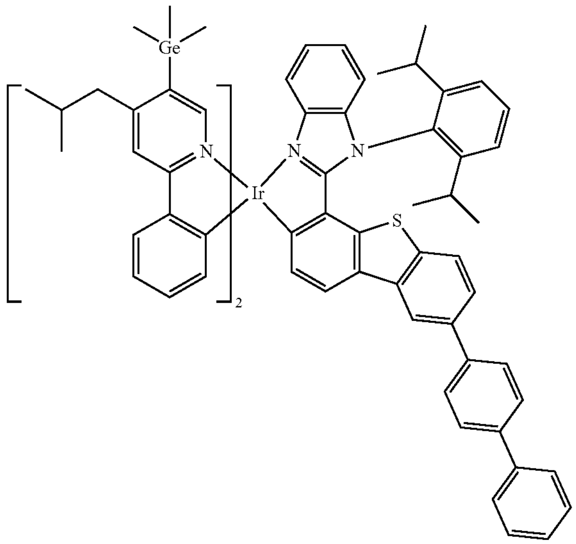
3170
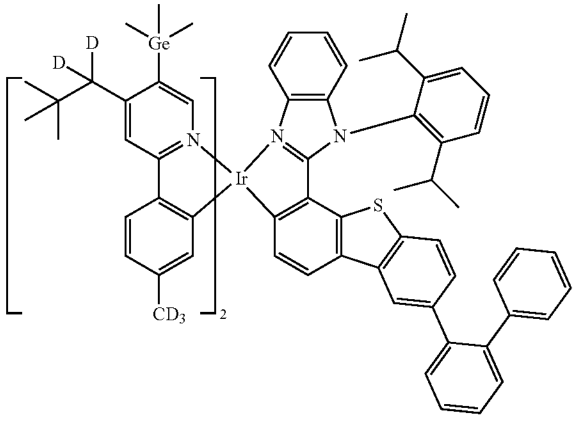
3171
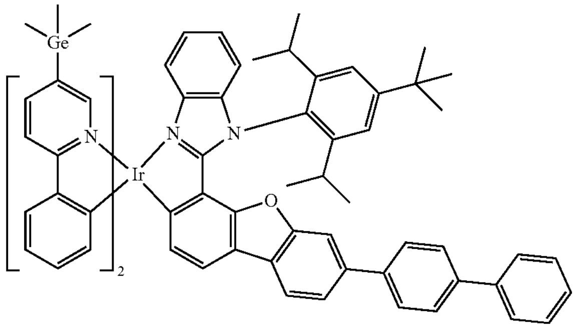

3172
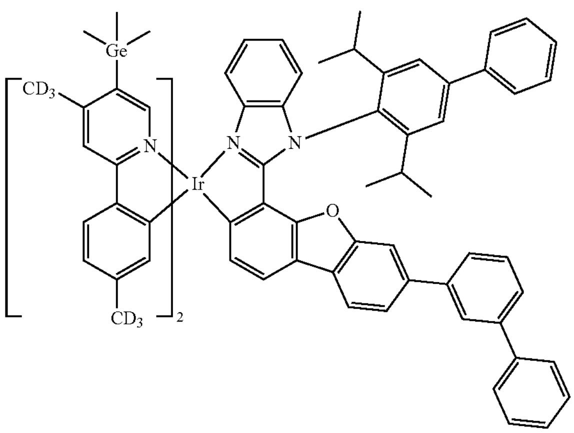
3173
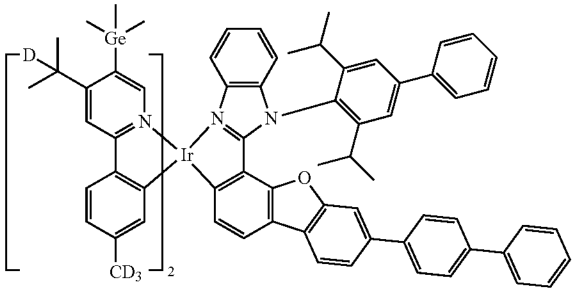
3174
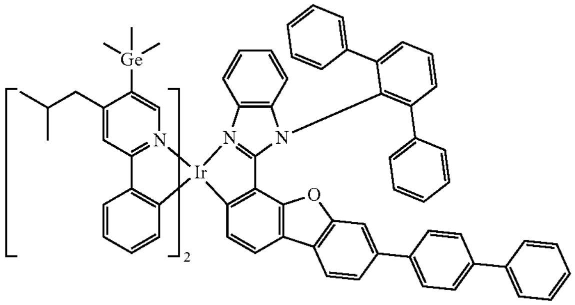
3175
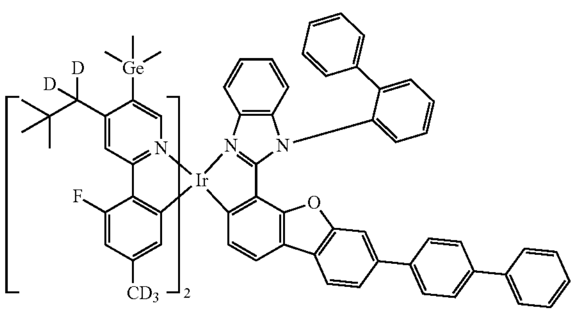
3176
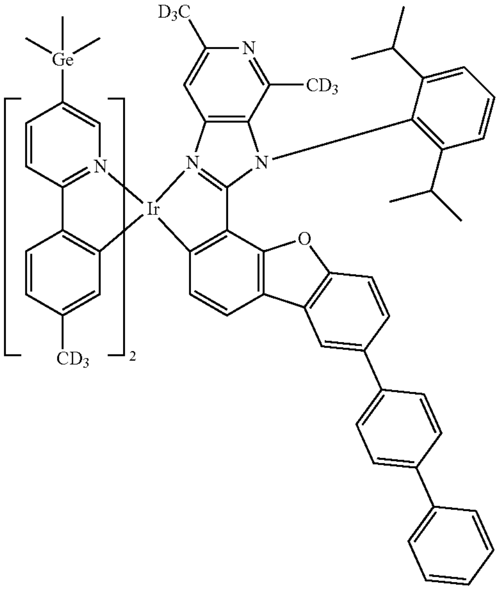
3177
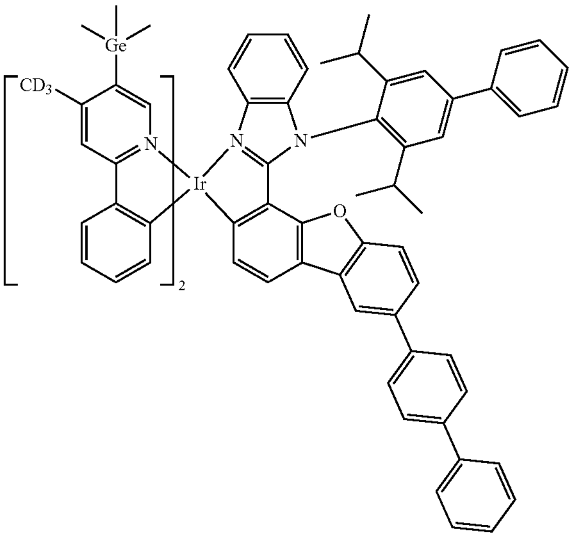
3178
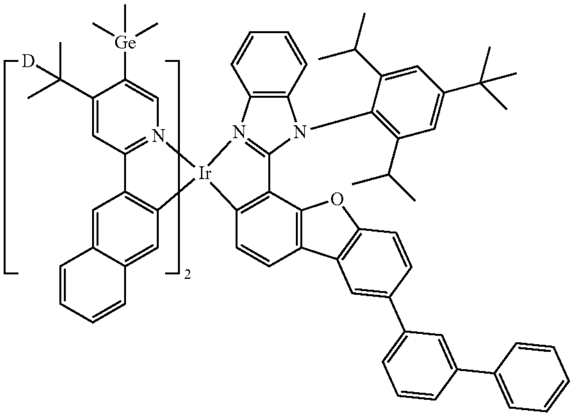

-continued
3179
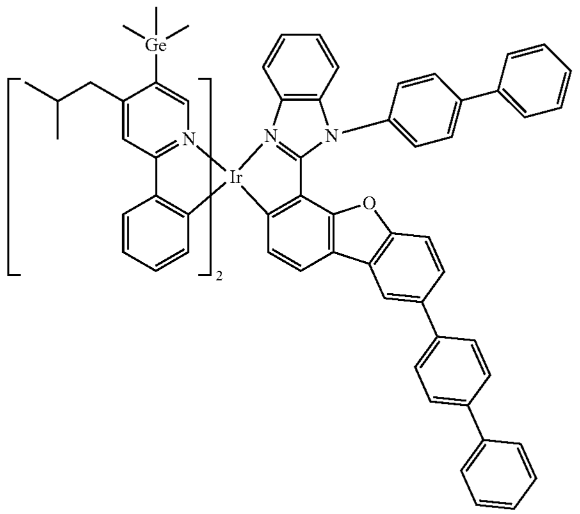
3180
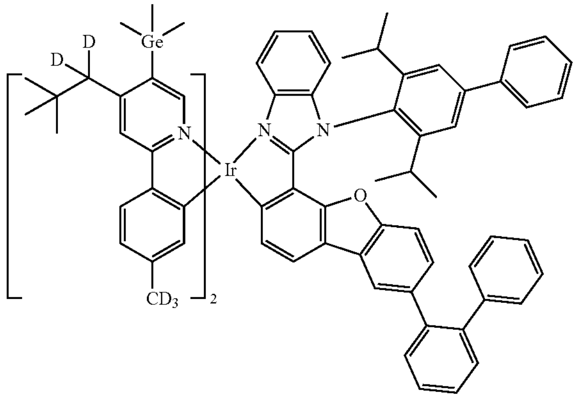
3181
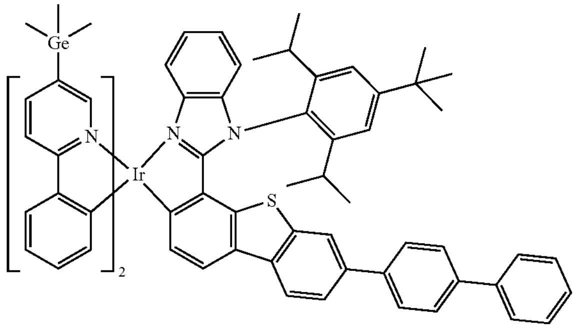
-continued
3182
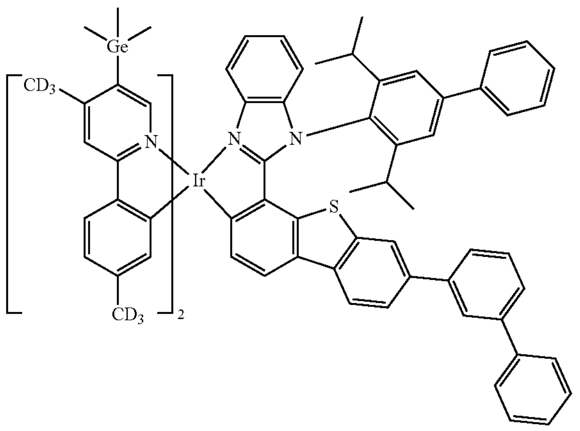
3183
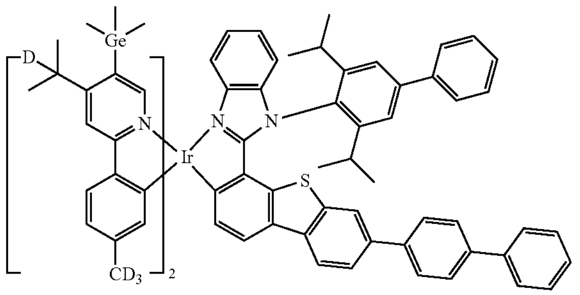
3184
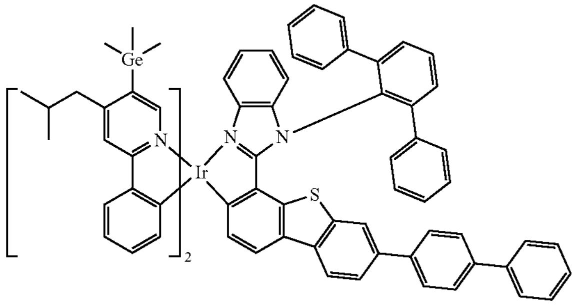
3185
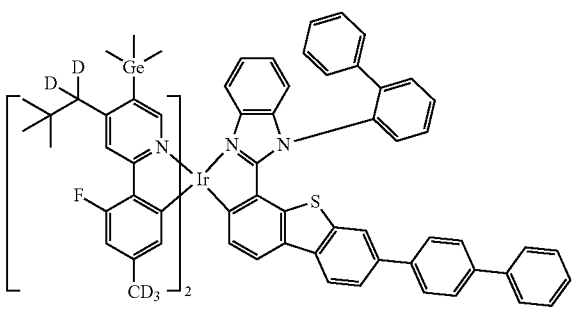

-continued
3186
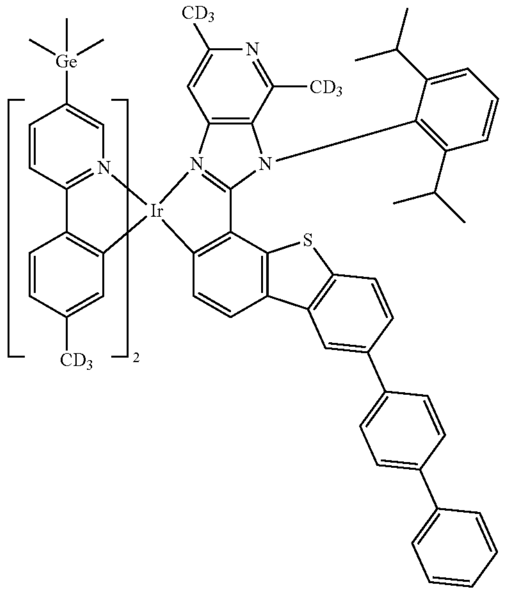
3187
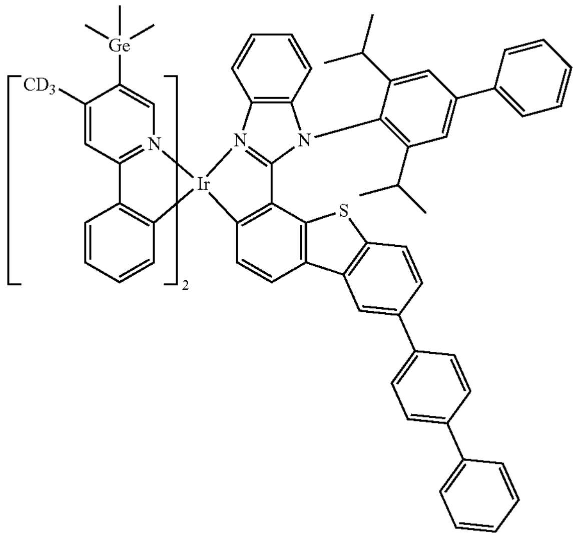
3188
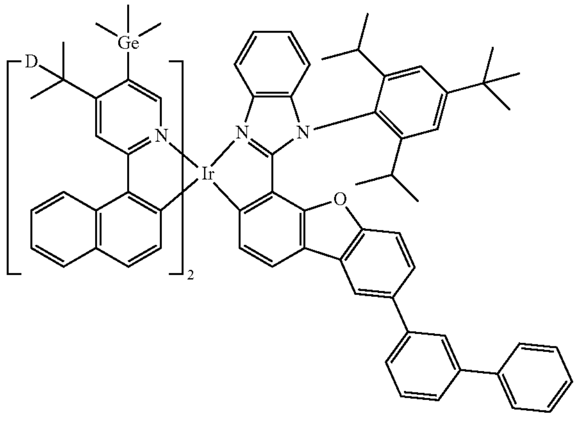
-continued
3189
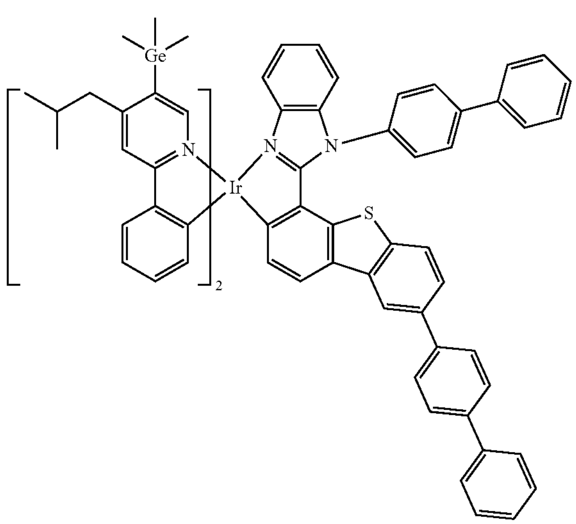
3190
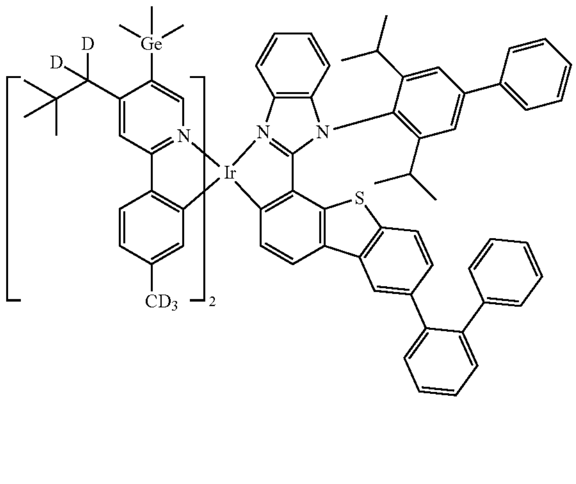
3191
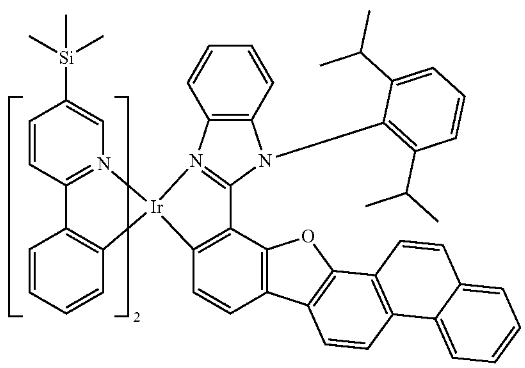

-continued
3192
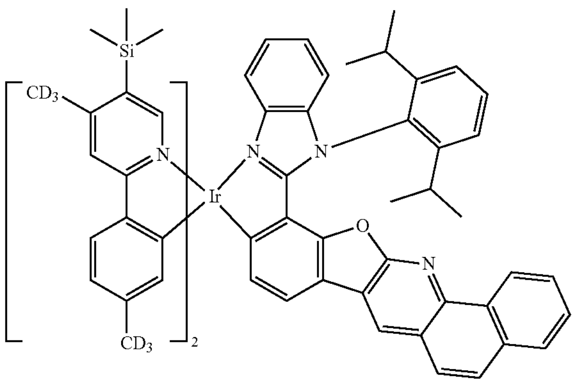
3193
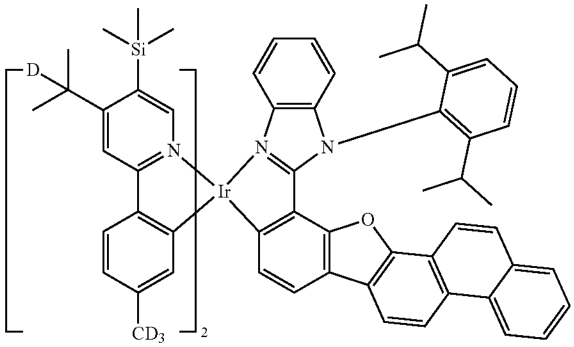
3194
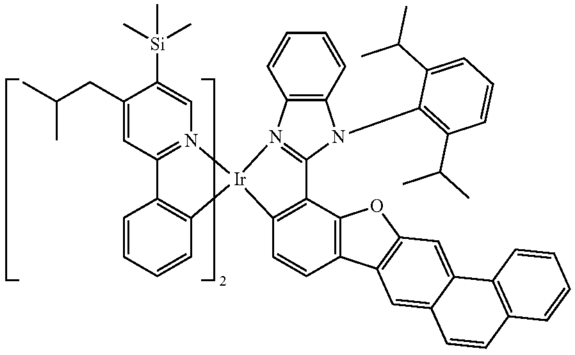
3195
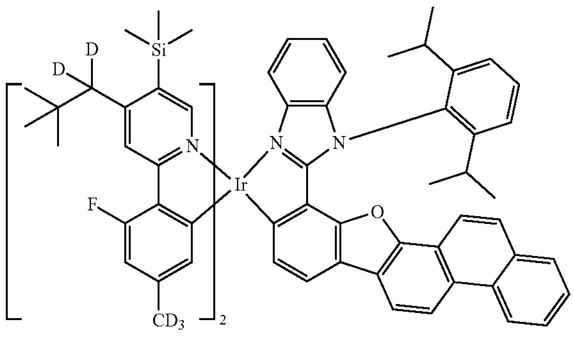
3196
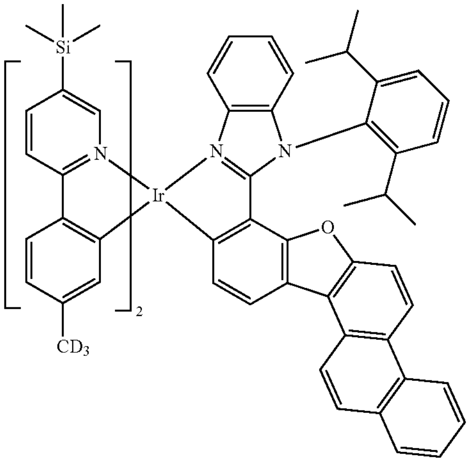
3197
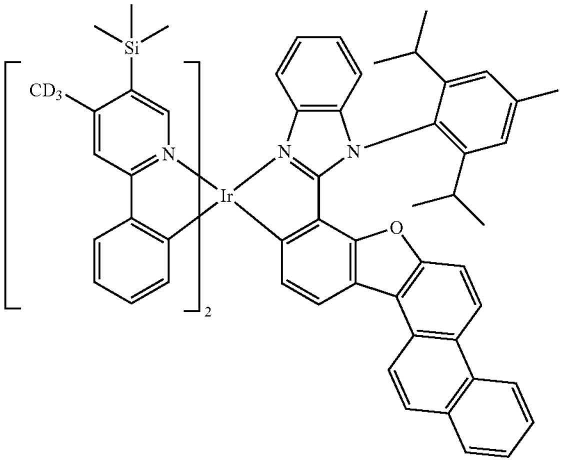
3198
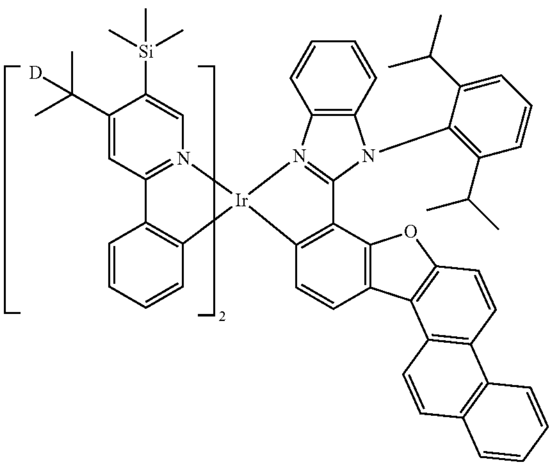

-continued
3199
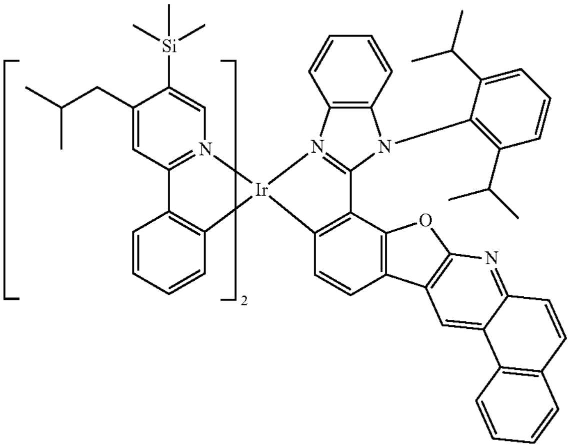
3200
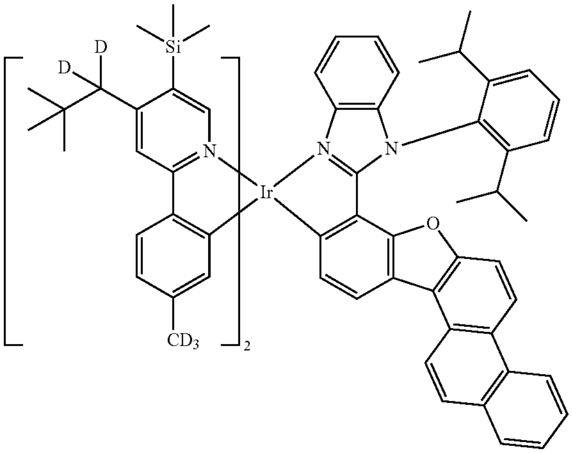
3201
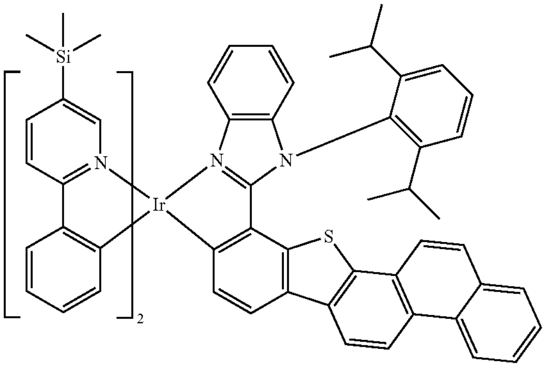
-continued
3202
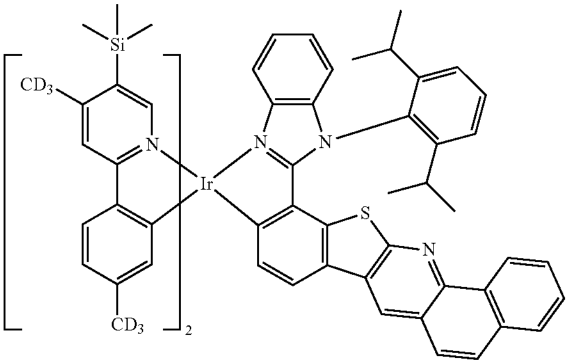
3203
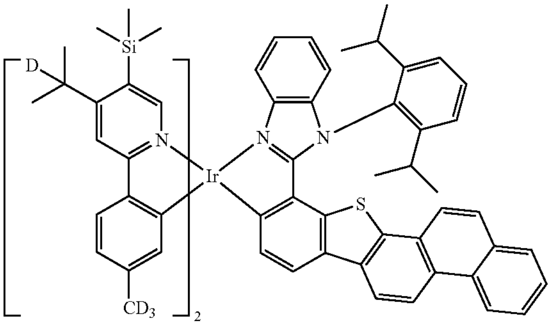
3204
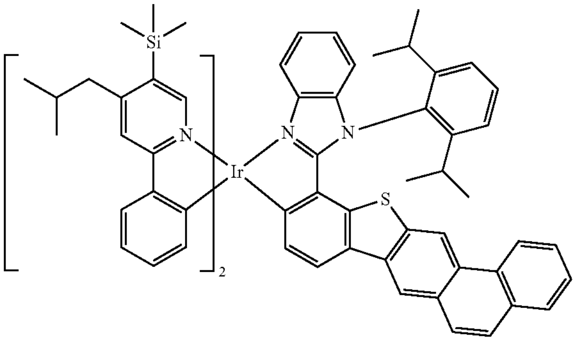
3205
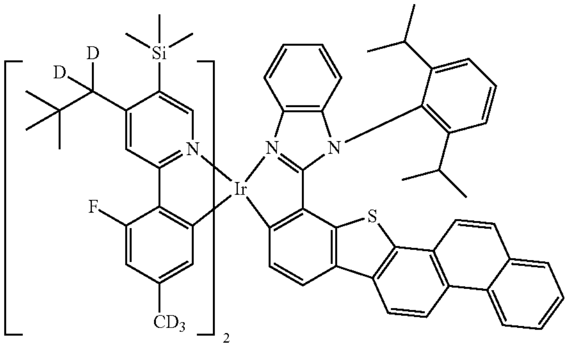

-continued
3206
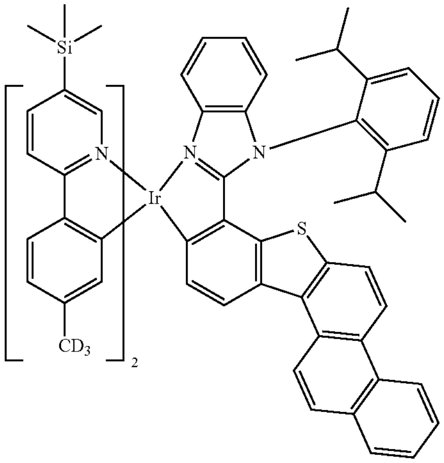
3207
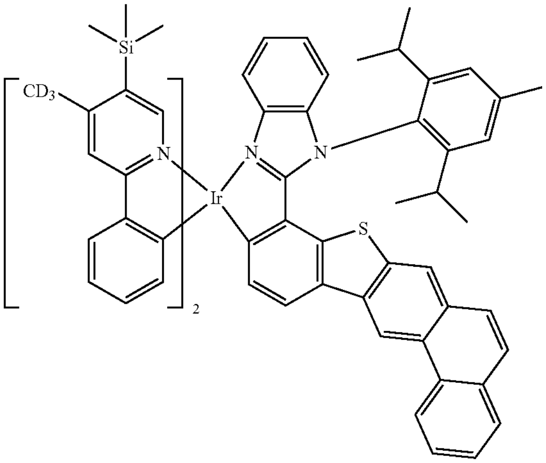
3208
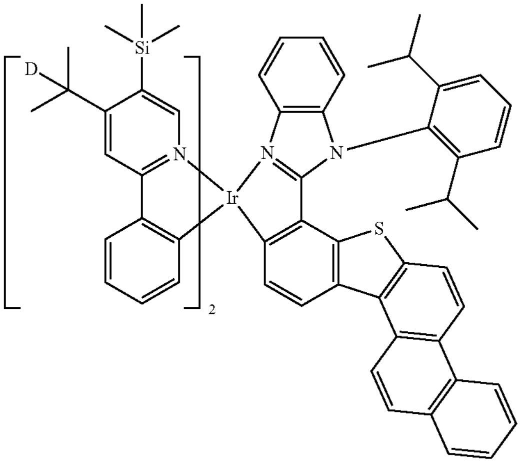
-continued
3209
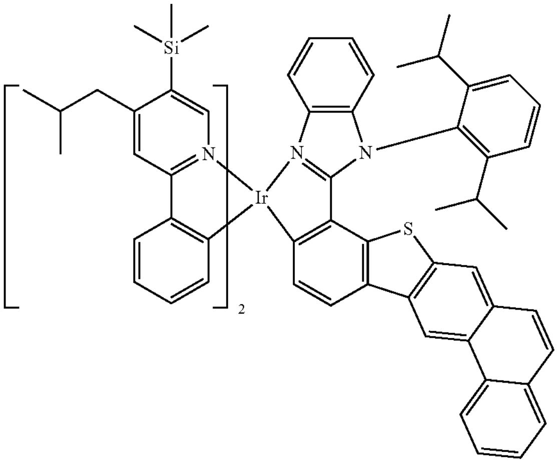
3210
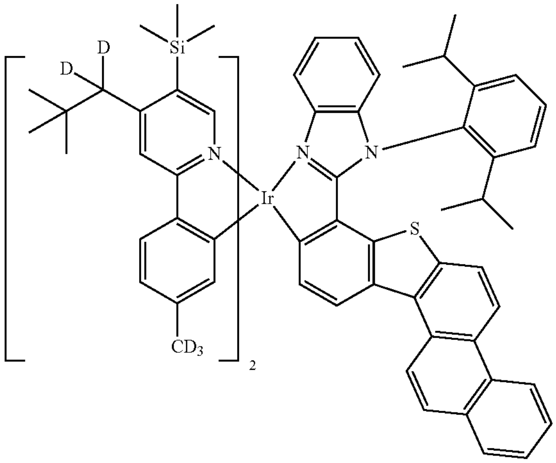
3211
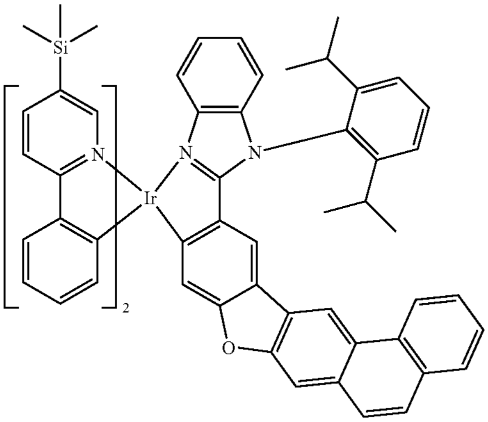

-continued
3212
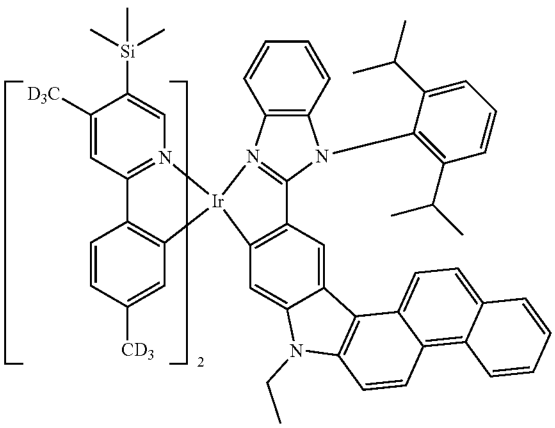
3213
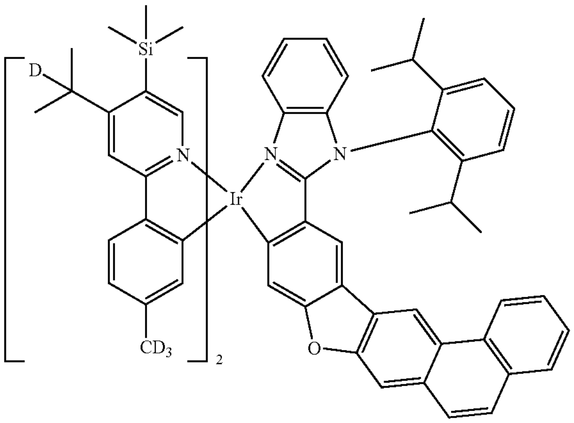
3214
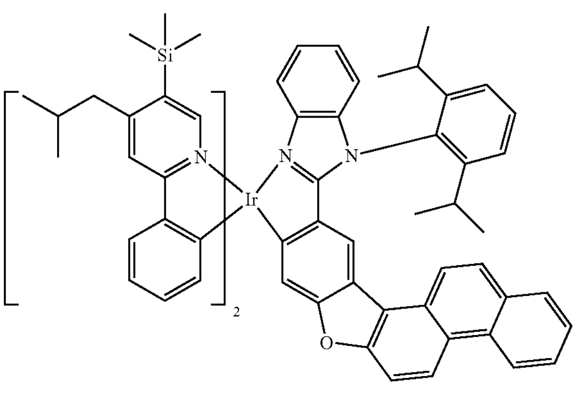
-continued
3215
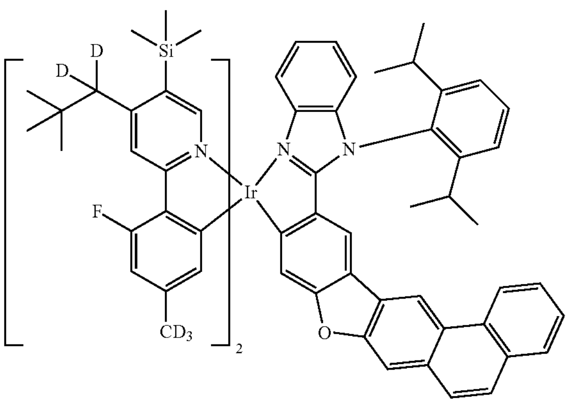
3216
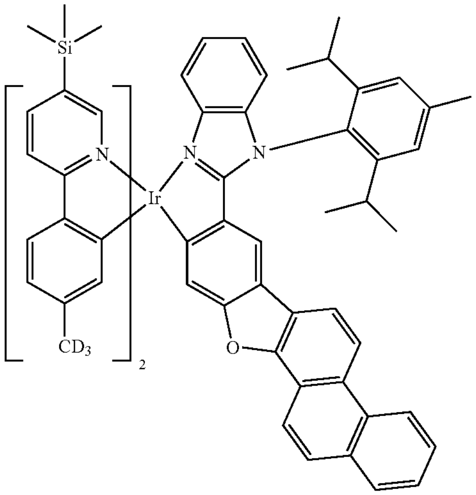
3217
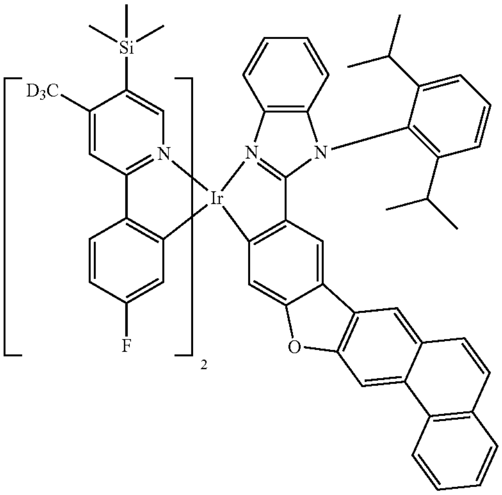

-continued
3218
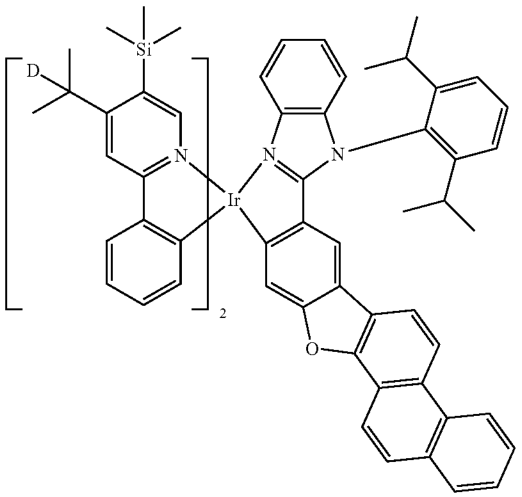
3219
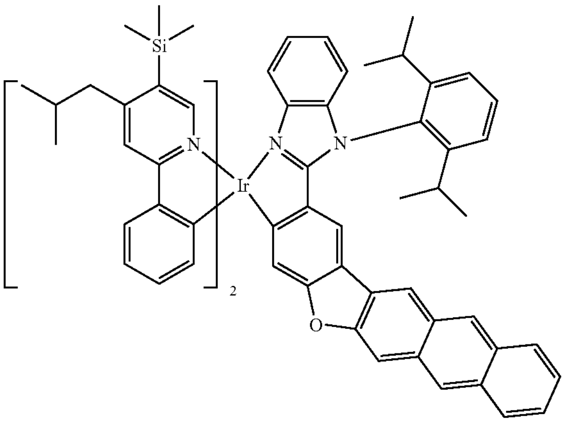
3220
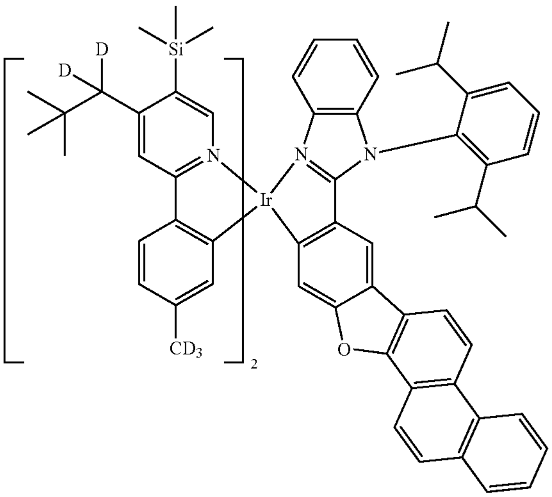
-continued
3221
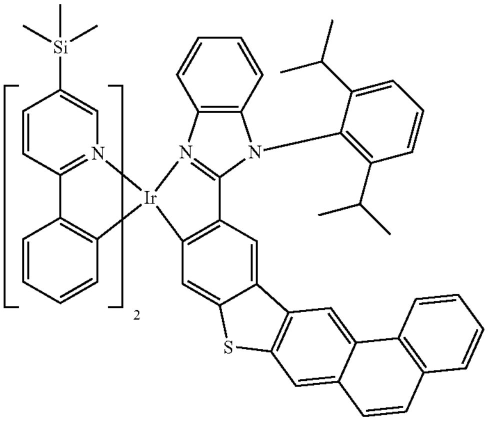
3222
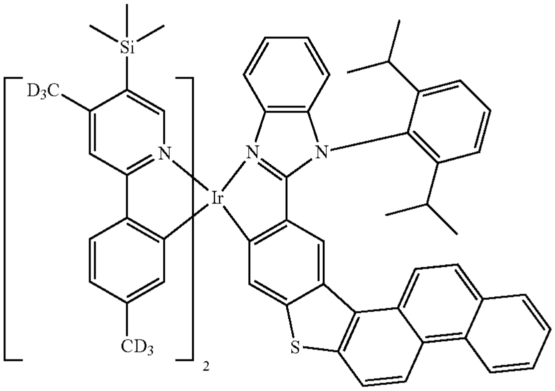
3223
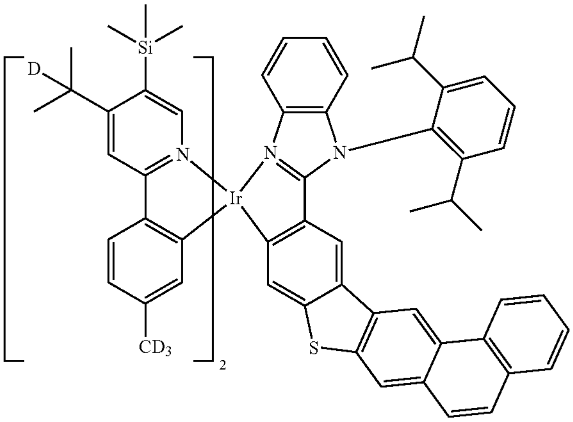

-continued
3224
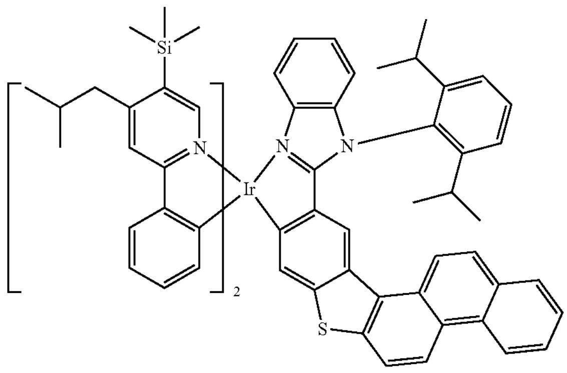
3225
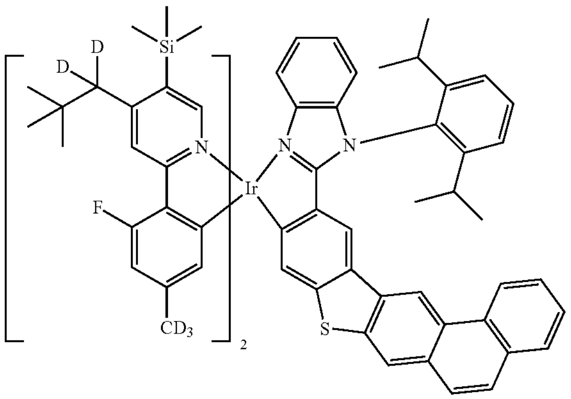
3226
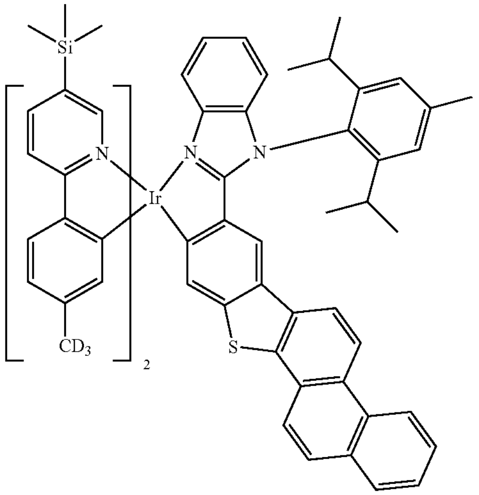
-continued
3227
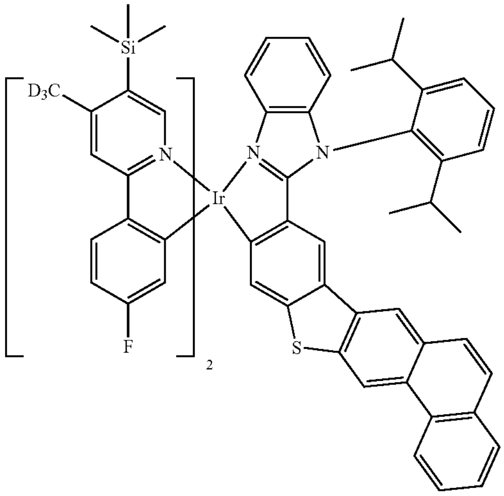
3228
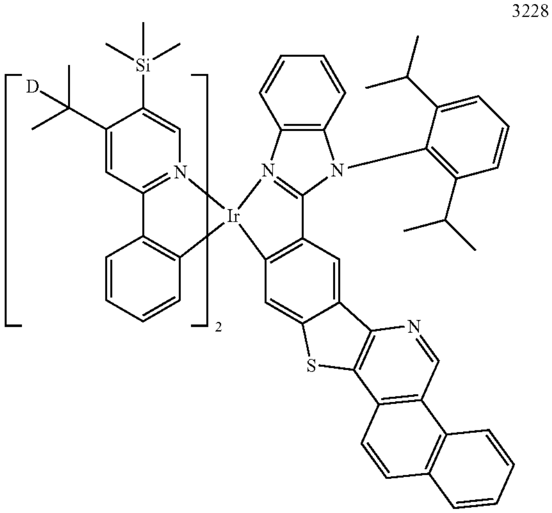
3229
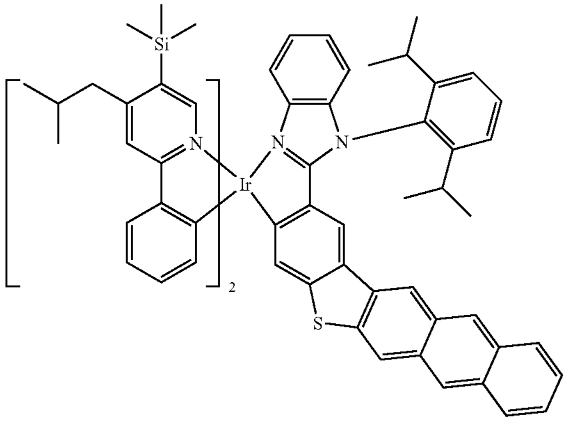

-continued
3230
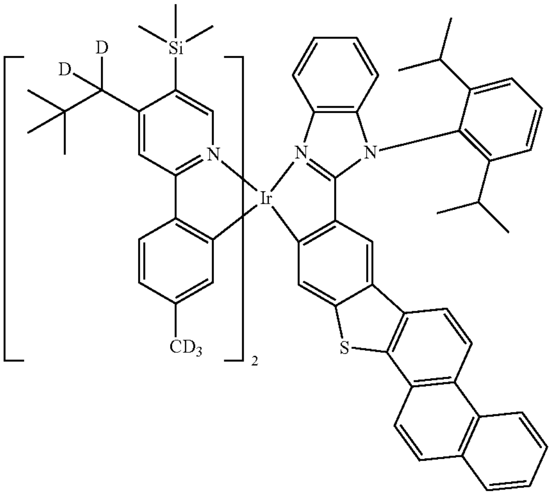
3231
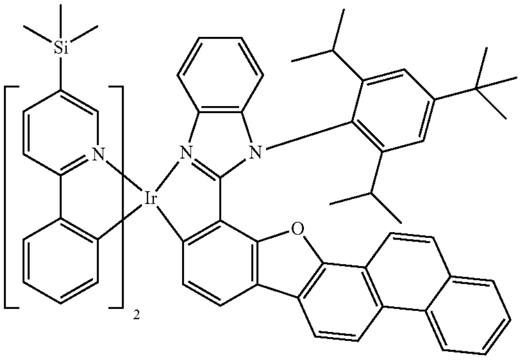
3232
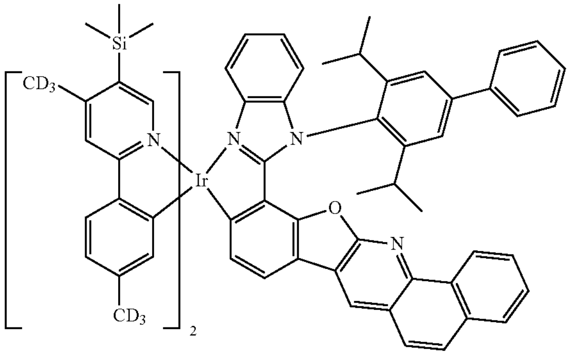
3233
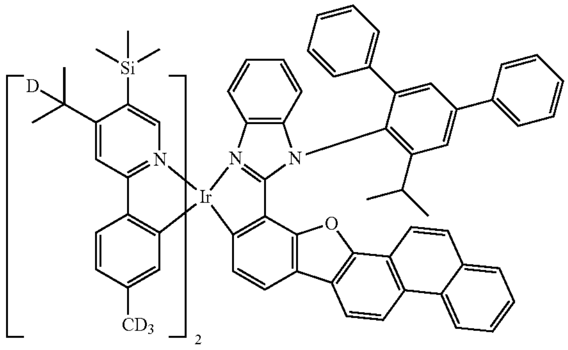
-continued
3234
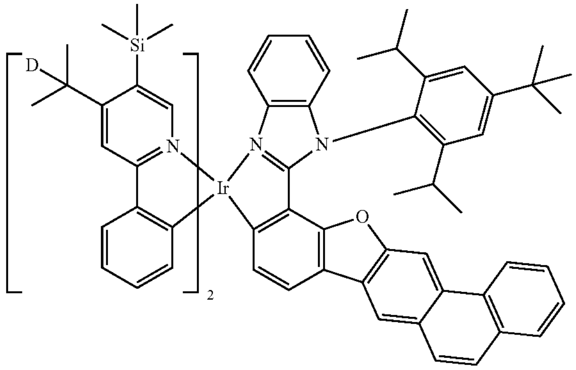
3235
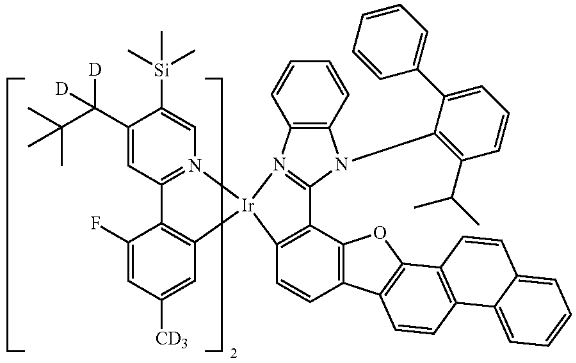
3236
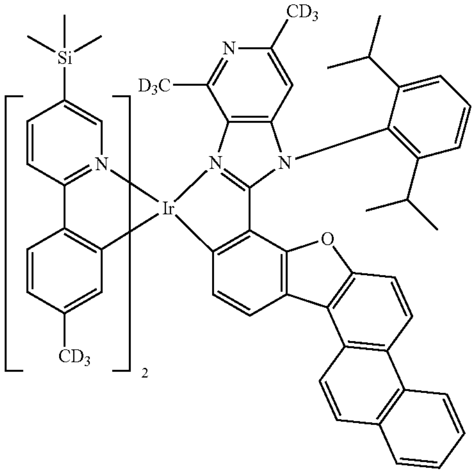

-continued
3237
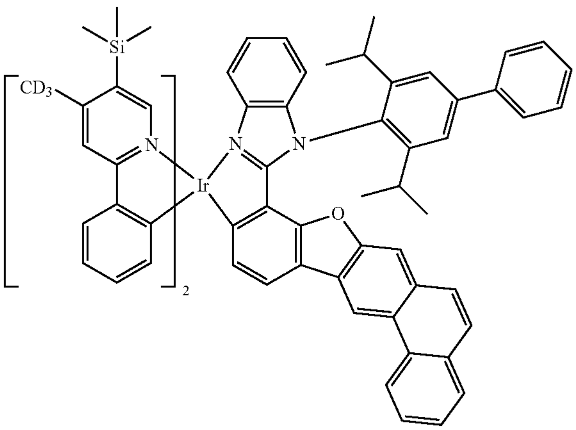
3238
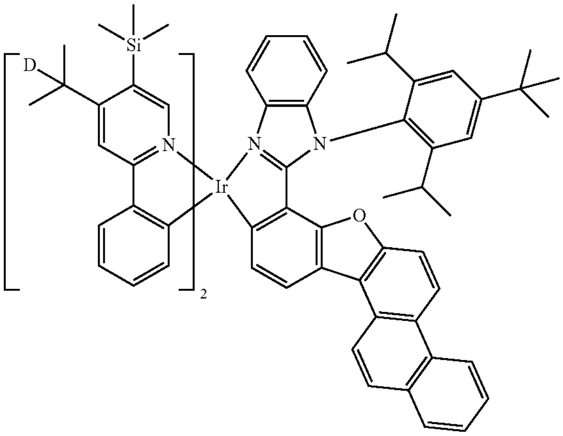
3239
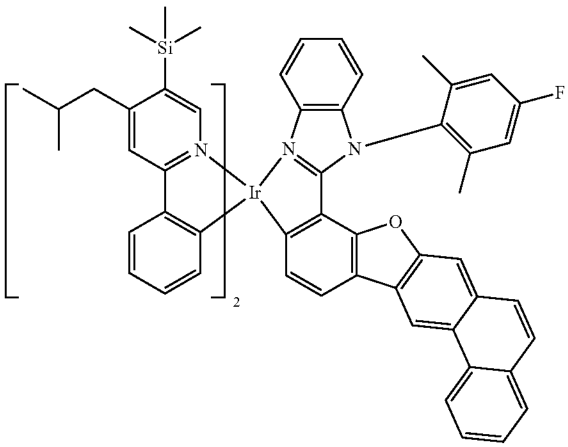
-continued
3240
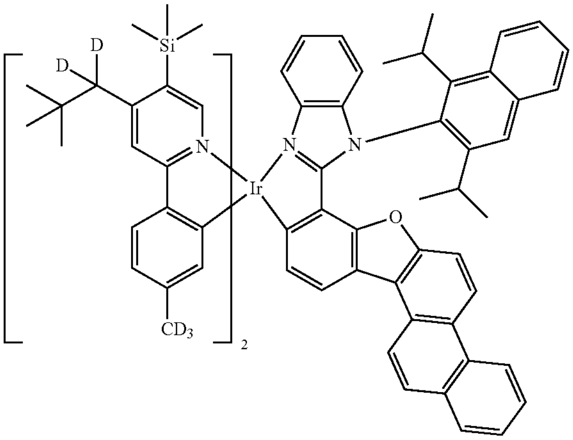
3241
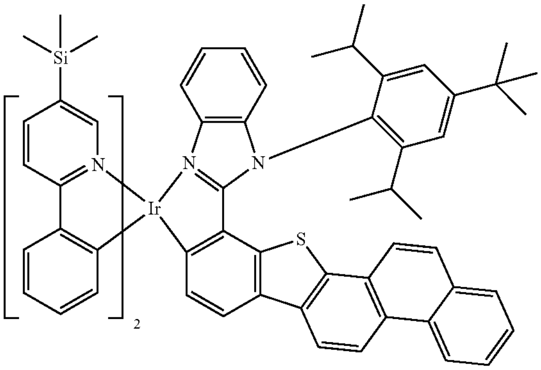
3242
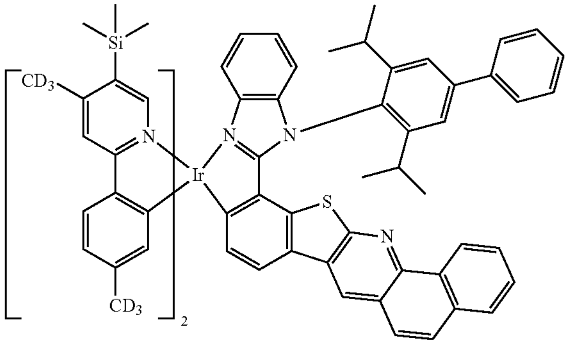
3243
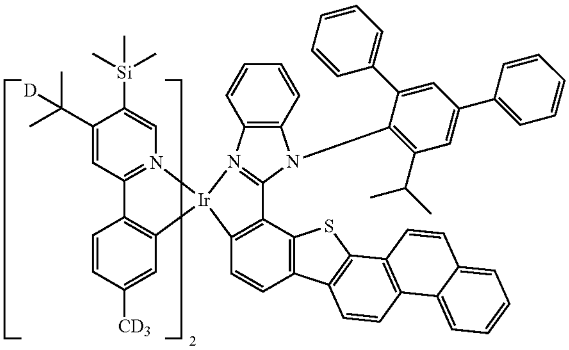

-continued
3244
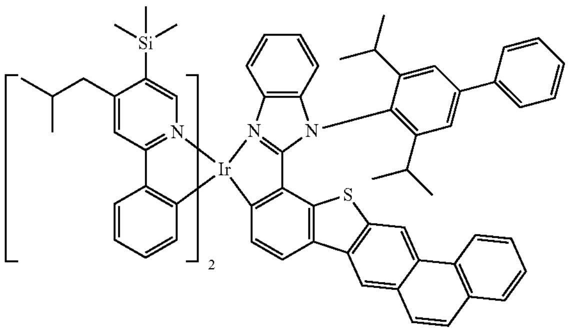
3245
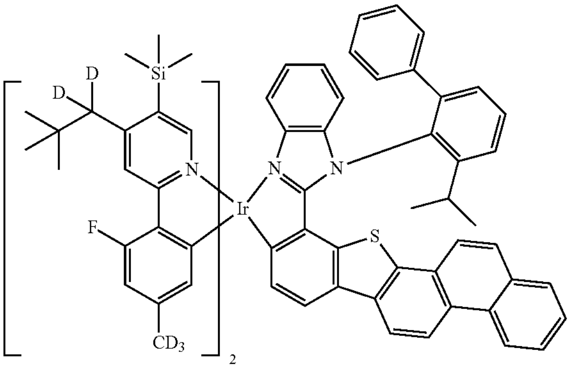
3246
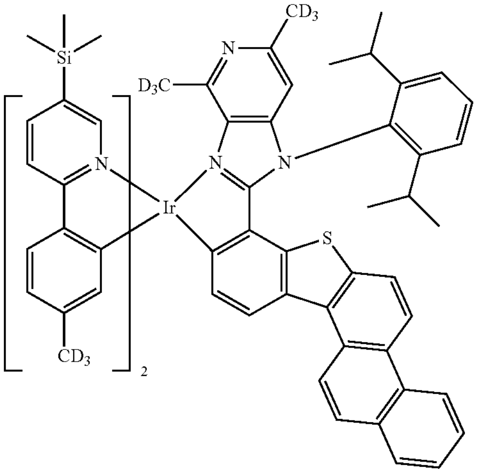
-continued
3247
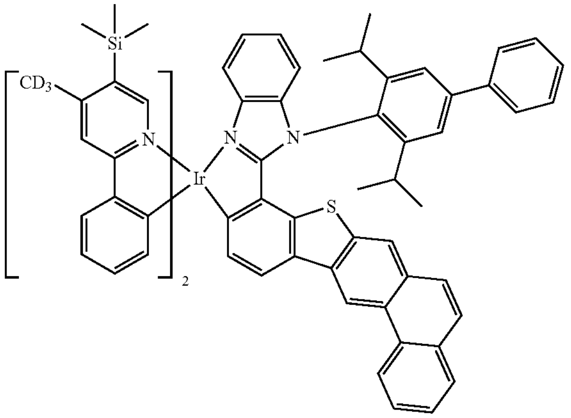
3248
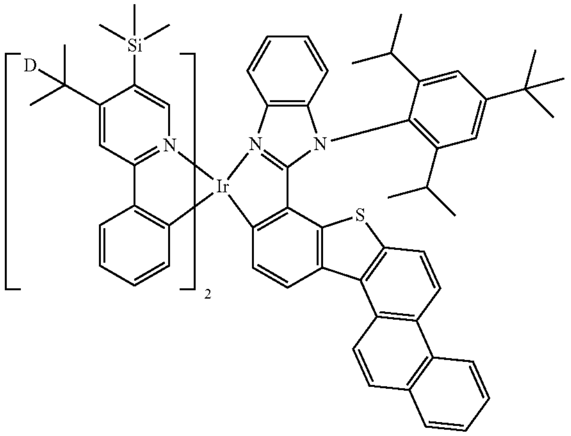
3249
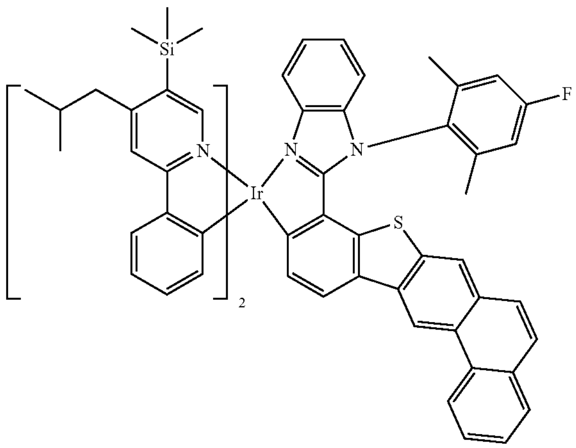

-continued
3250
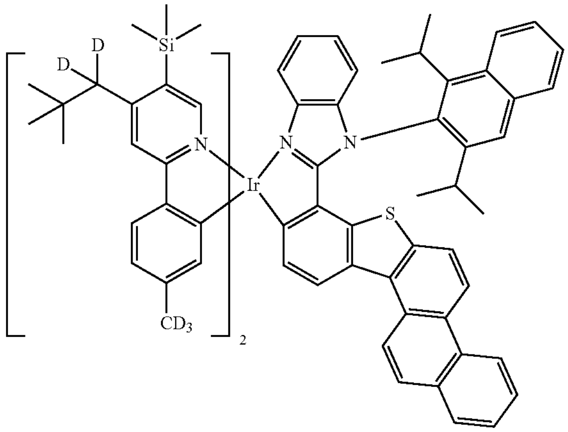
3251
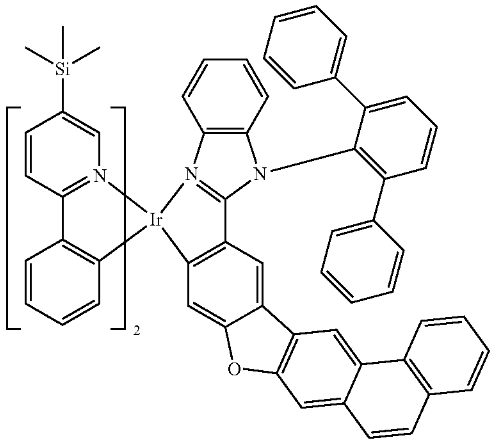
3252
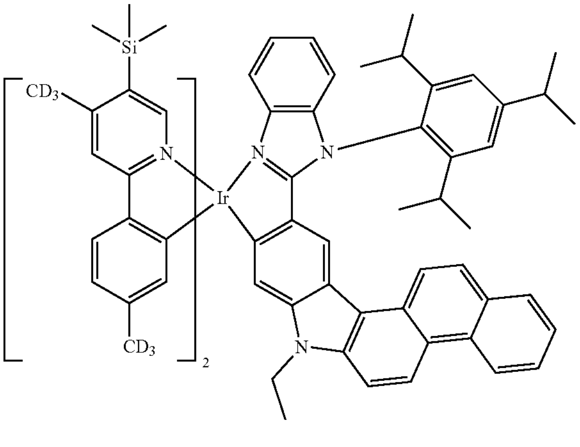
-continued
3253
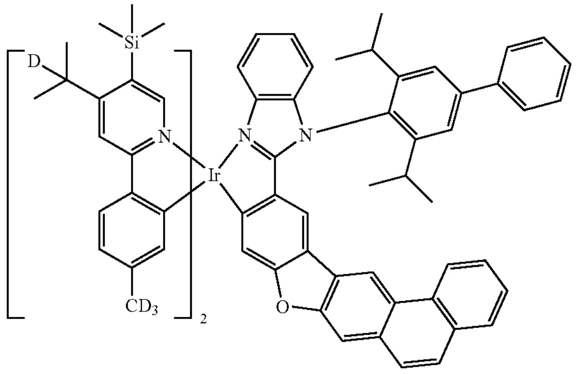
3254
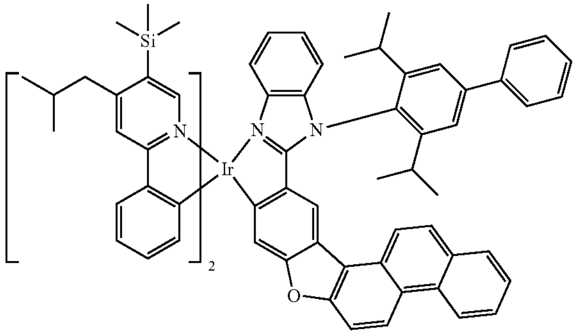
3255
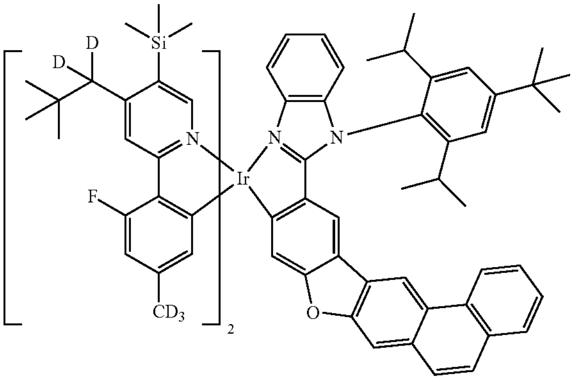

-continued
3256
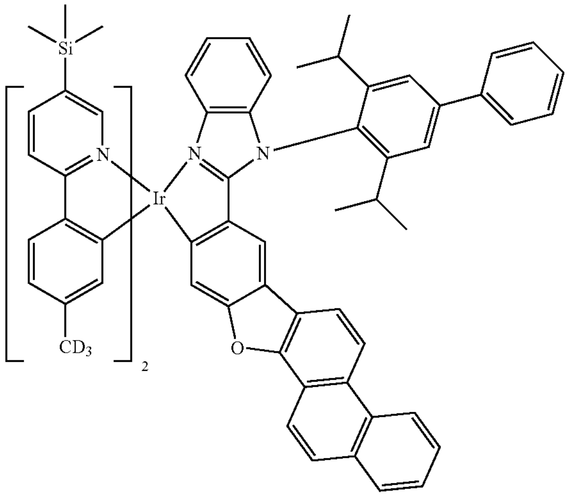
3257
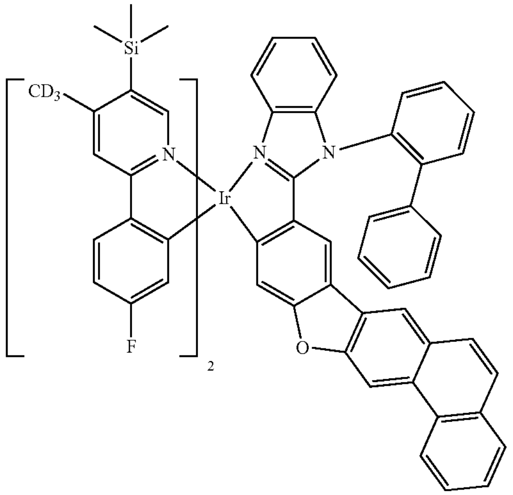
3258
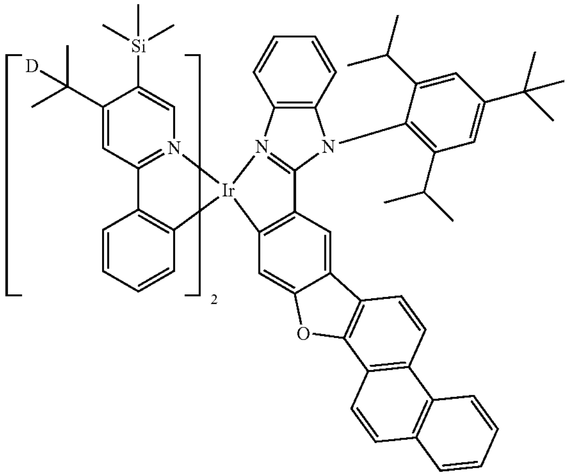
-continued
3259
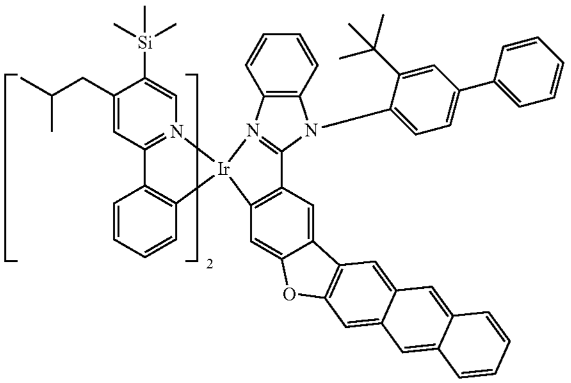
3260
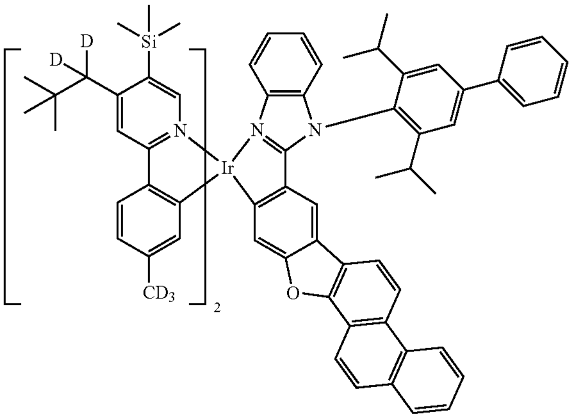
3261
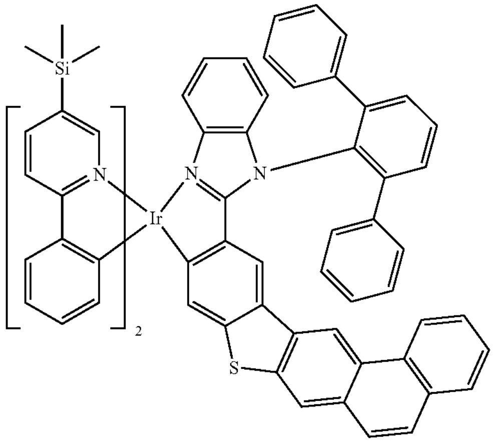

-continued
3262
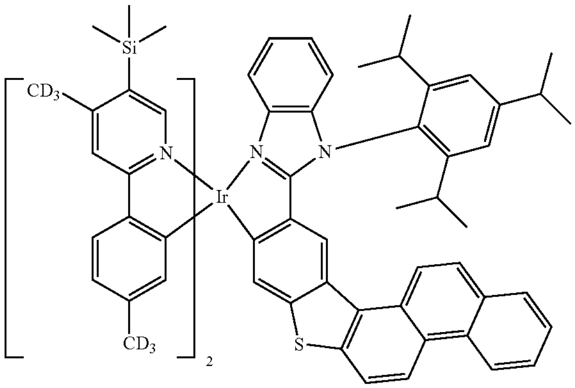
3263
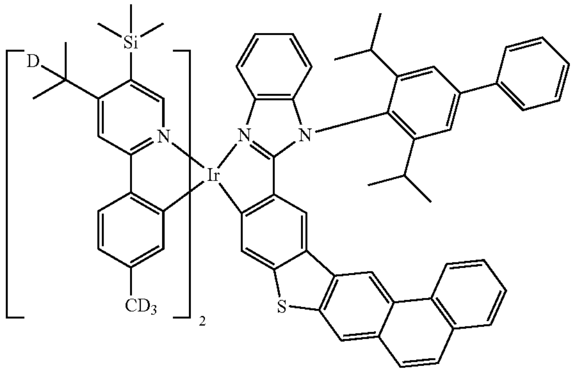
3264
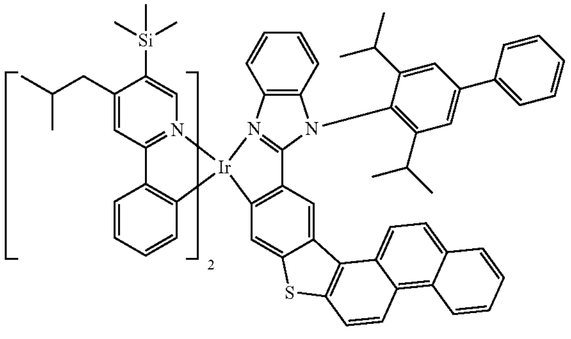
3265
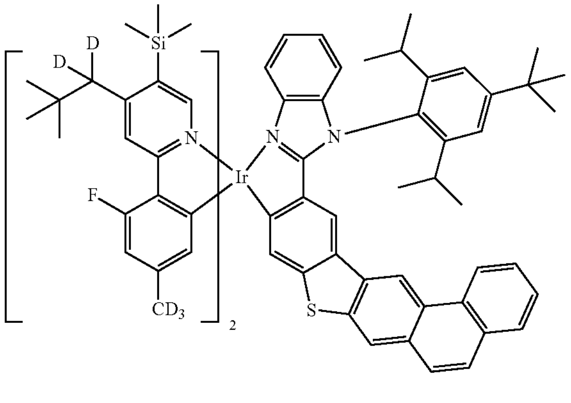
-continued
3266
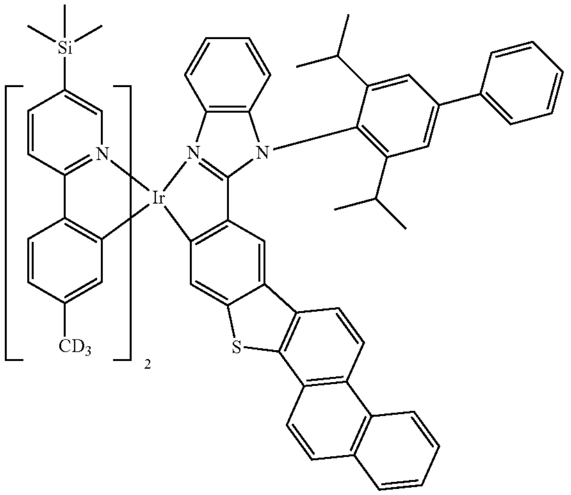
3267
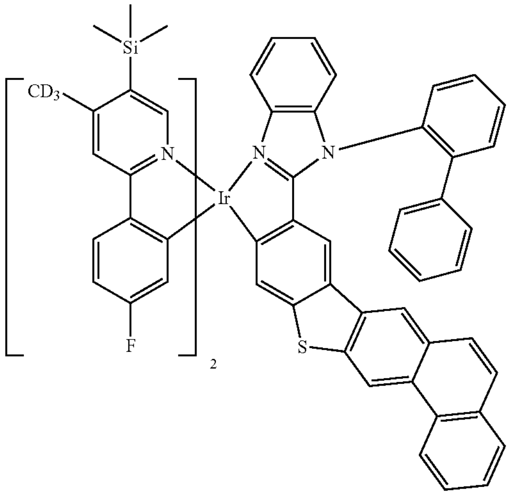
3268
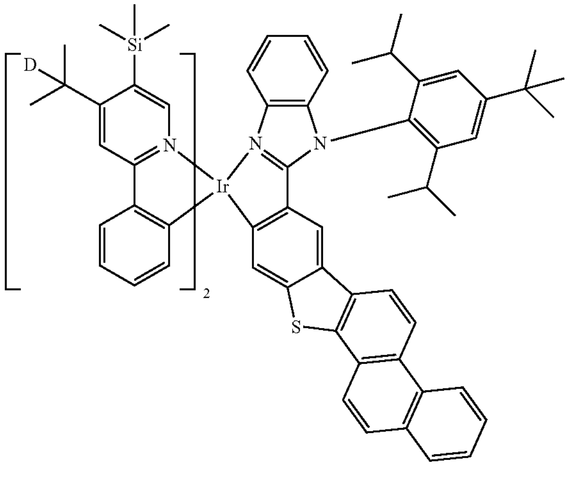

-continued
3269
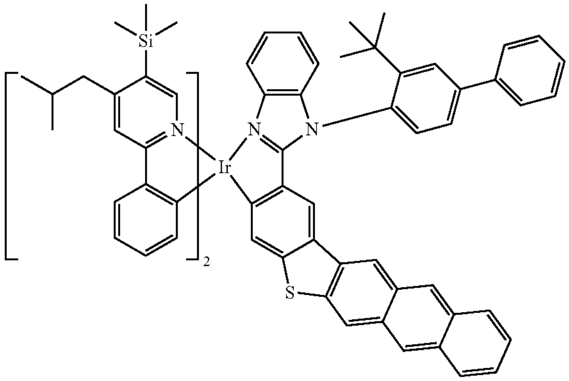
3270
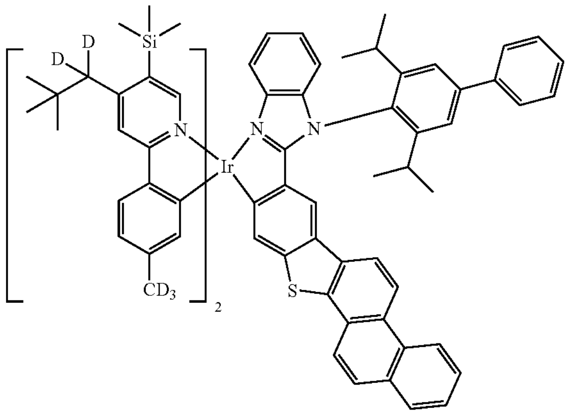
3271
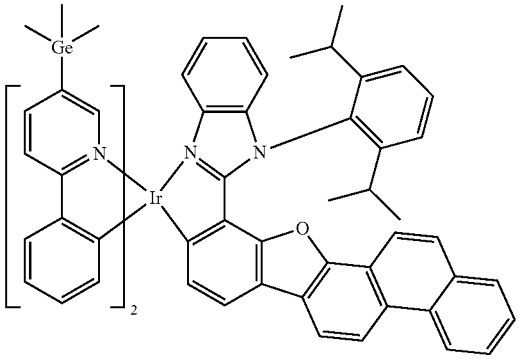
3272
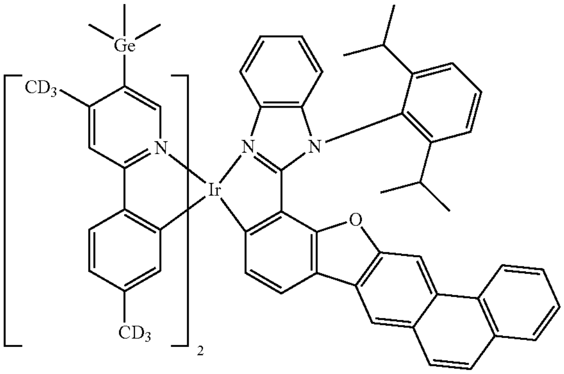
-continued
3273
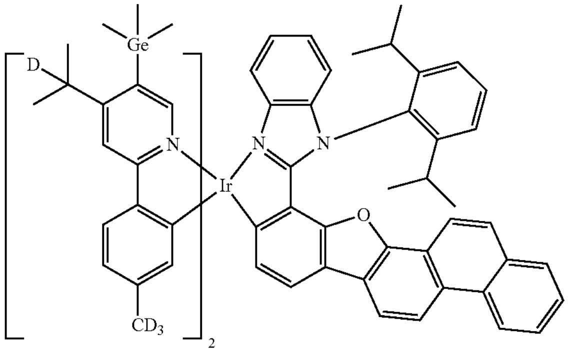
3274
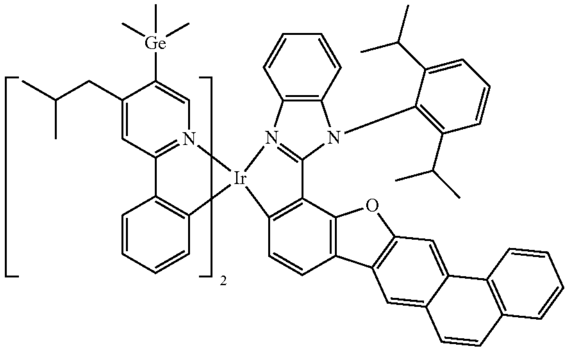
3275
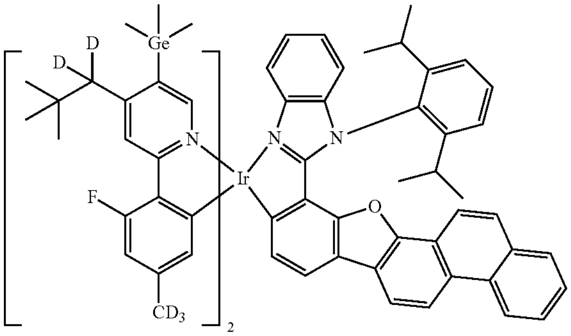
3276
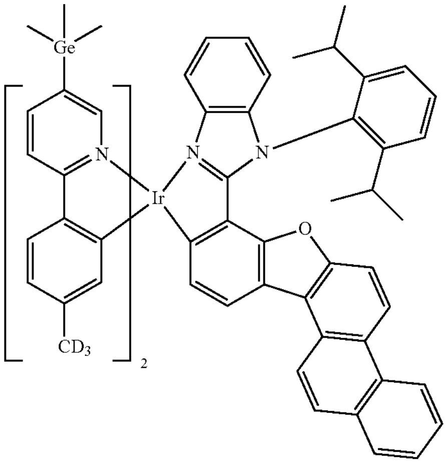

-continued
3277
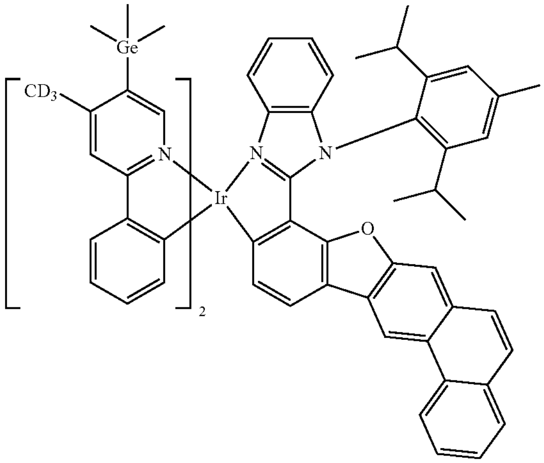
3278
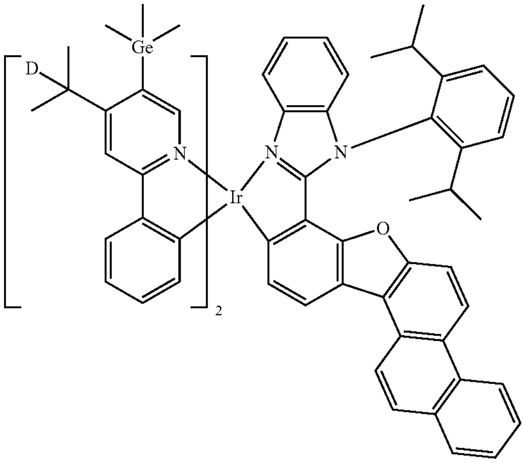
3279
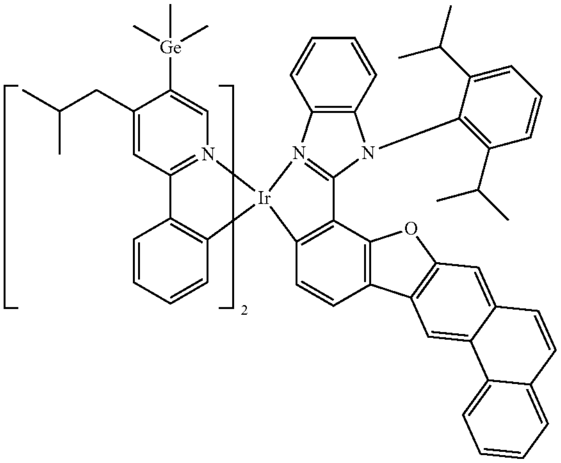
-continued
3280
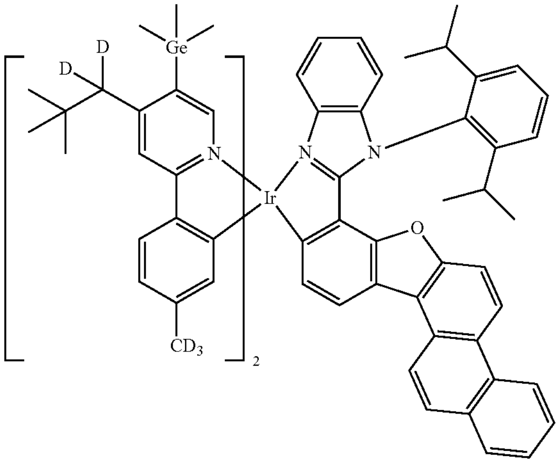
3281
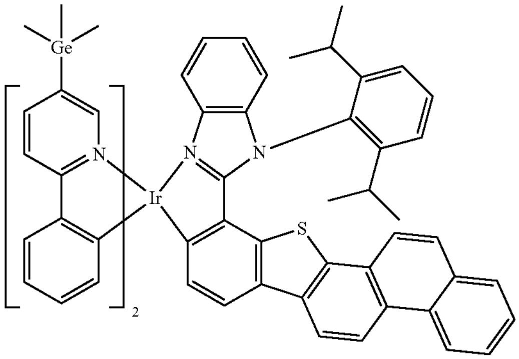
3282
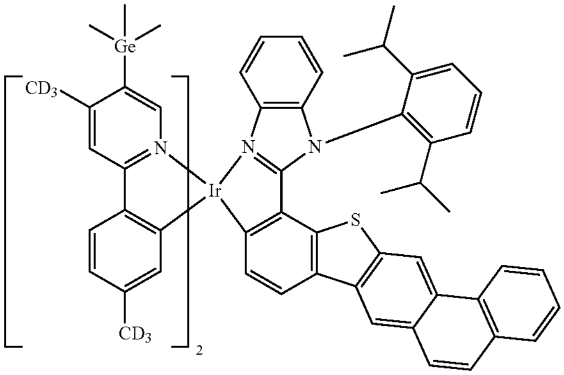
3283
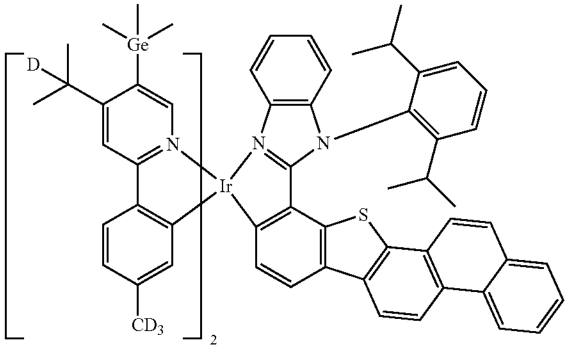

3284
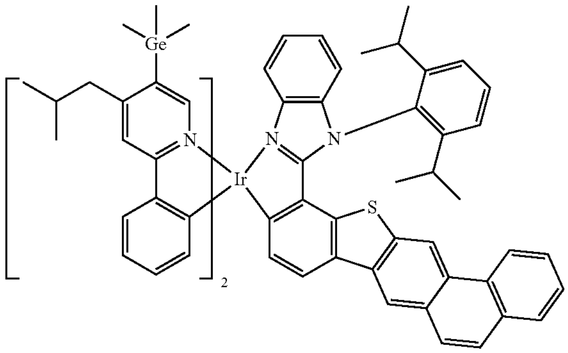
3285
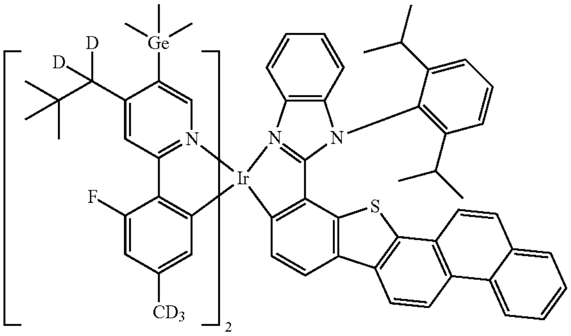
3286
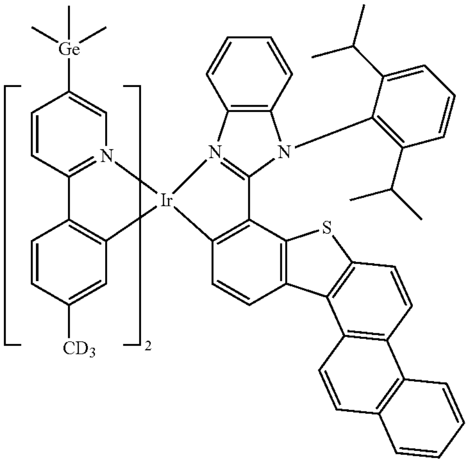
3287
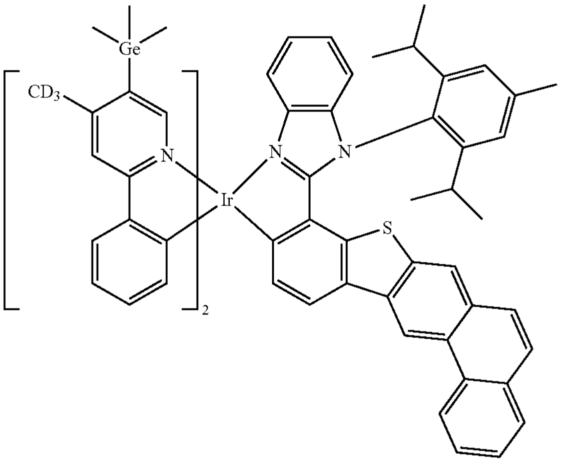
3288
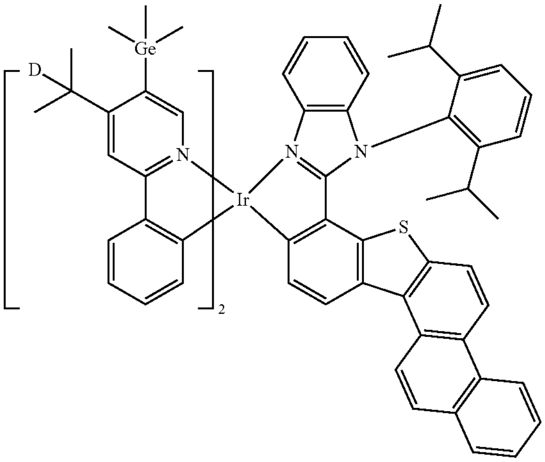
3289
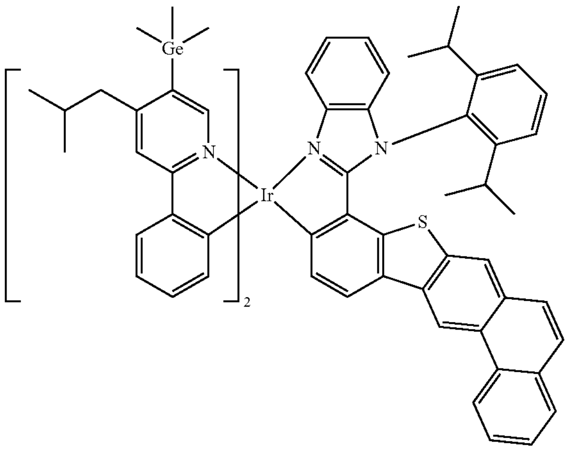

-continued
3290
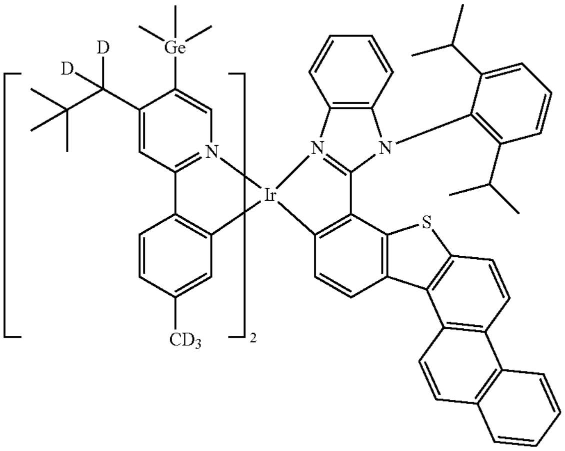
3291
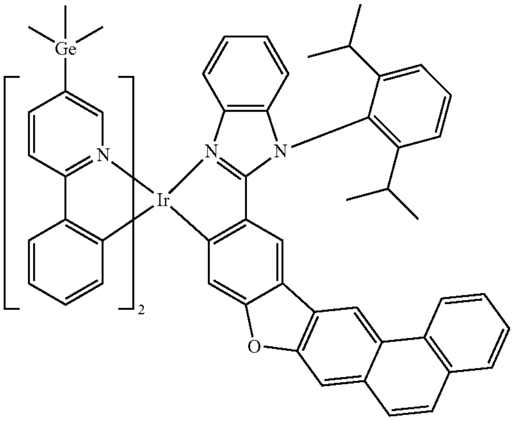
3292
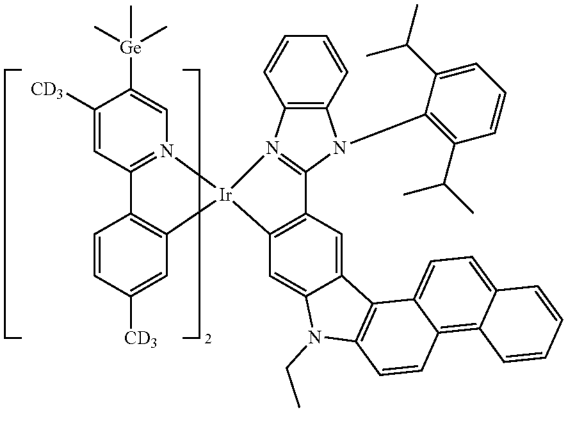
-continued
3293
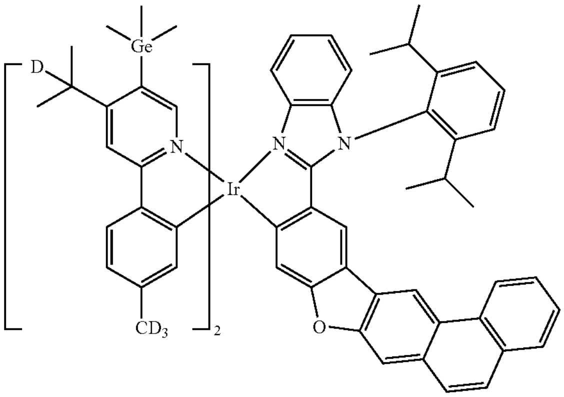
3294
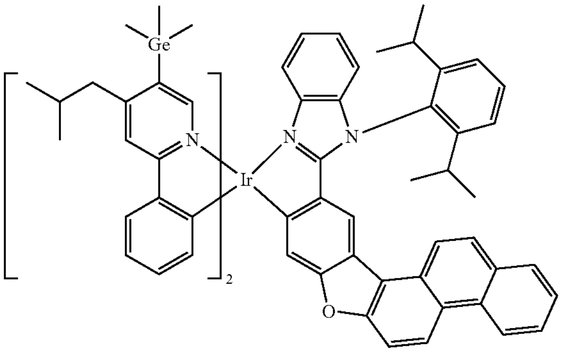
3295
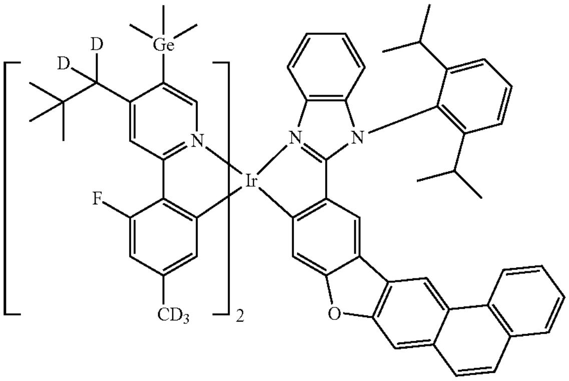

-continued
3296
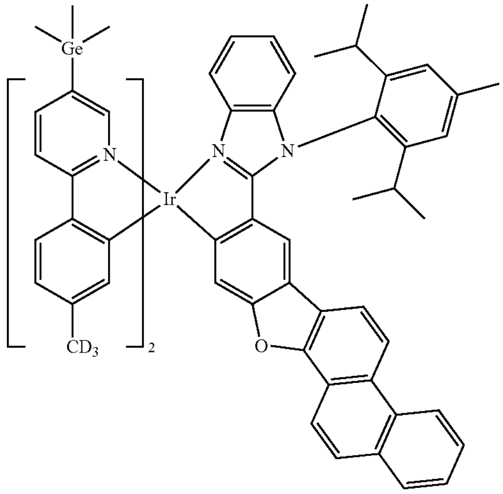
3297
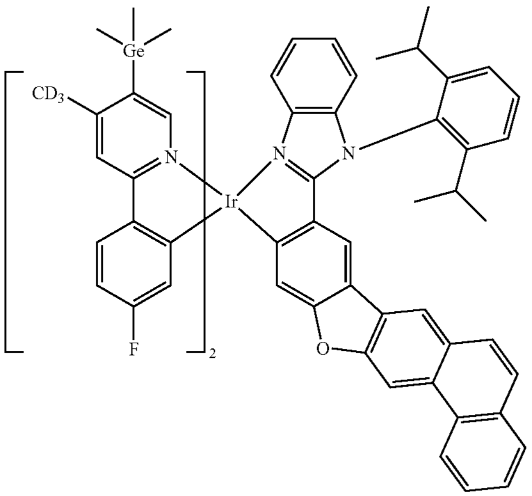
3298
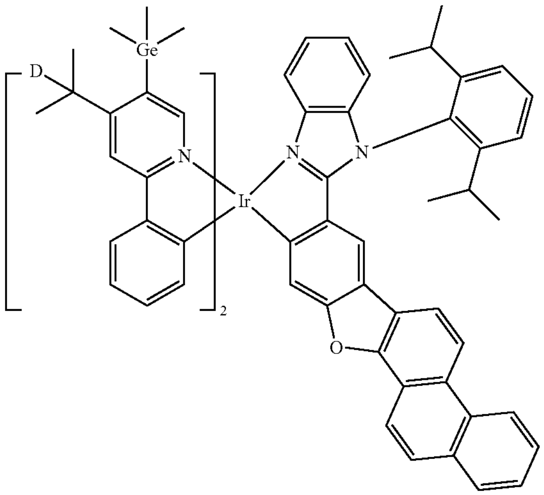
-continued
3299
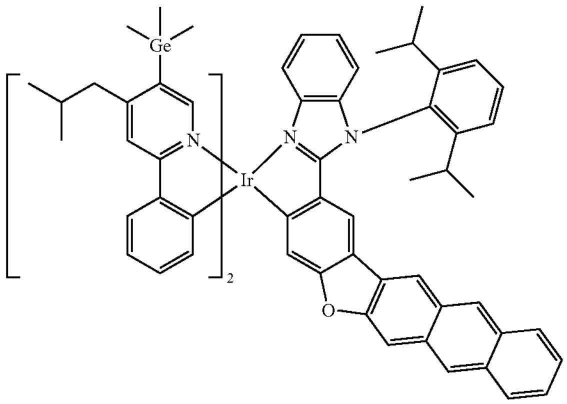
3300
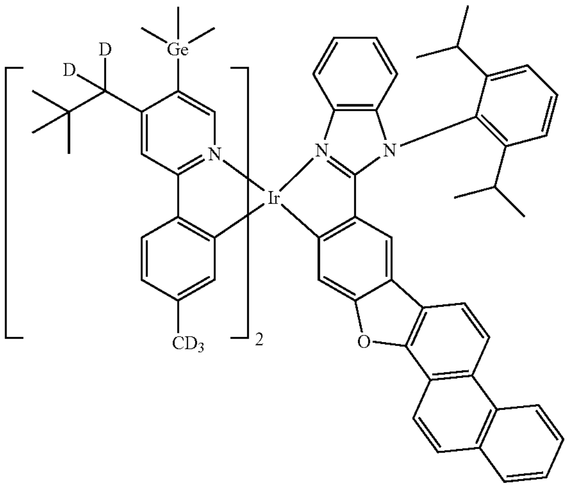
3301
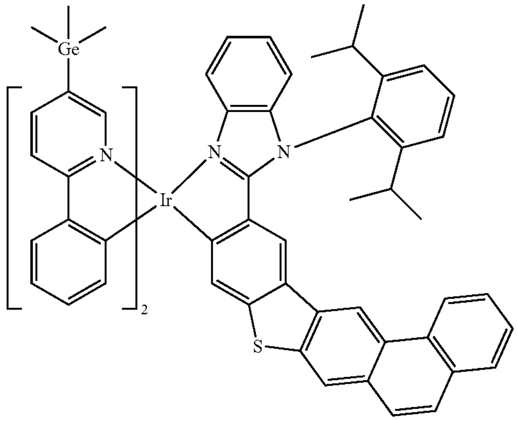

-continued
3302
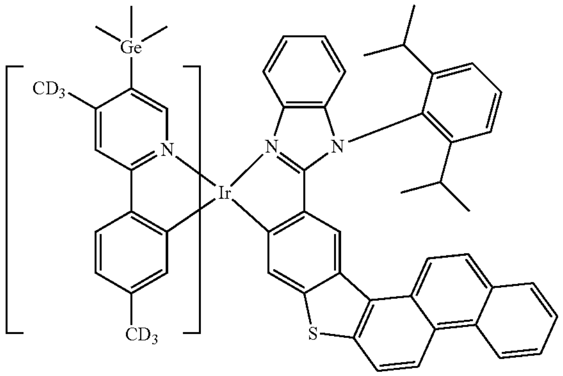
3303
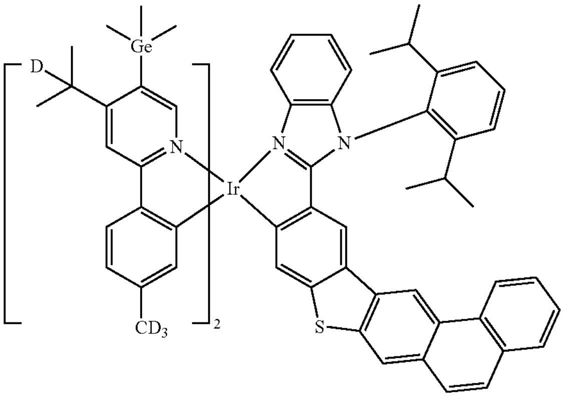
3304
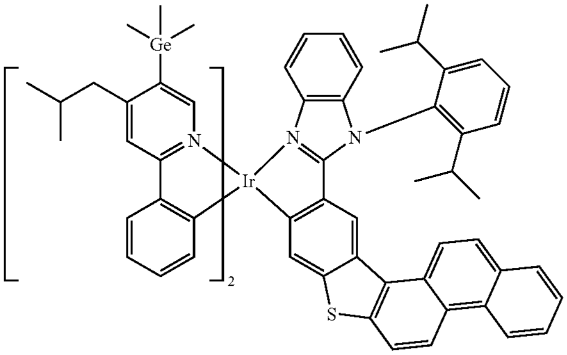
3305
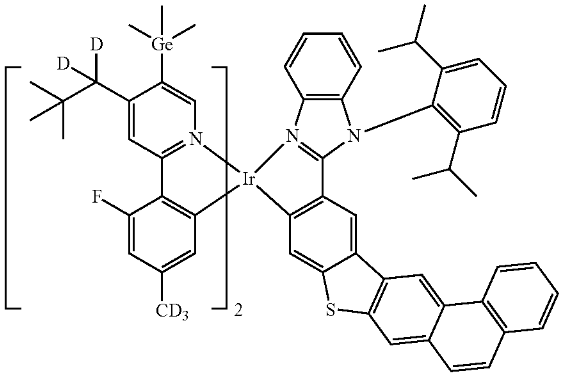
3306
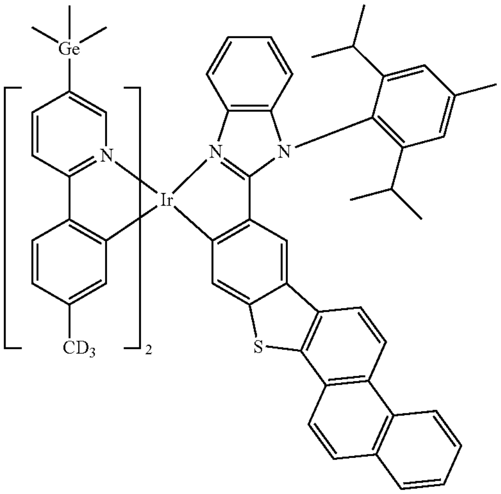
3307
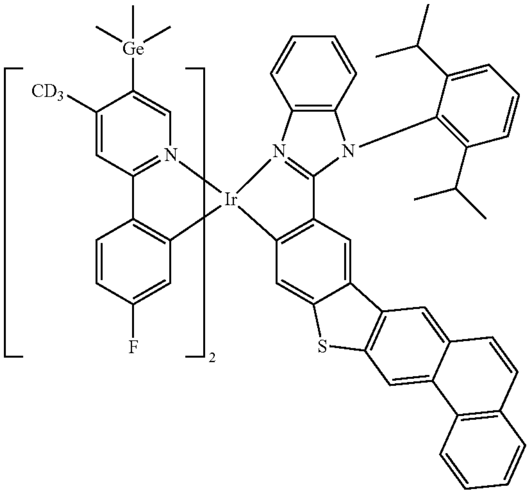
3308
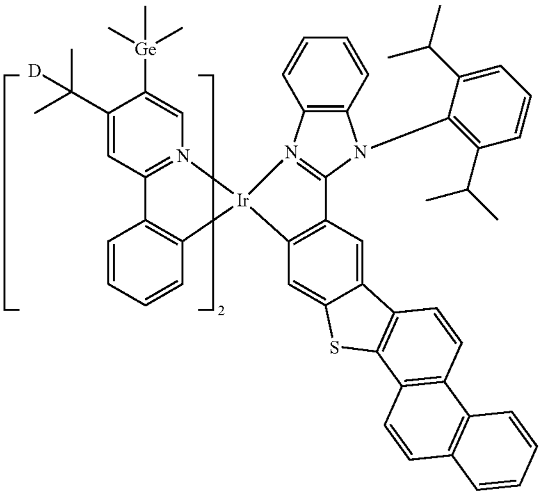

-continued
3309
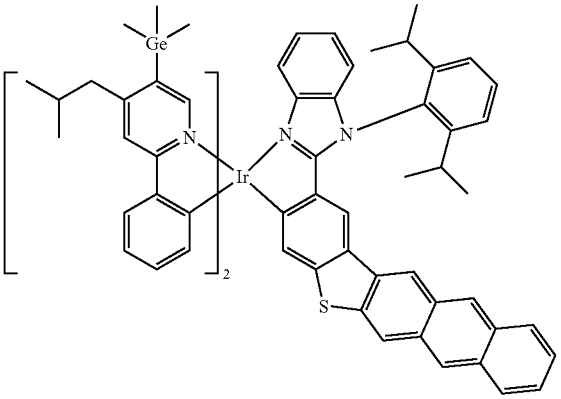
3310
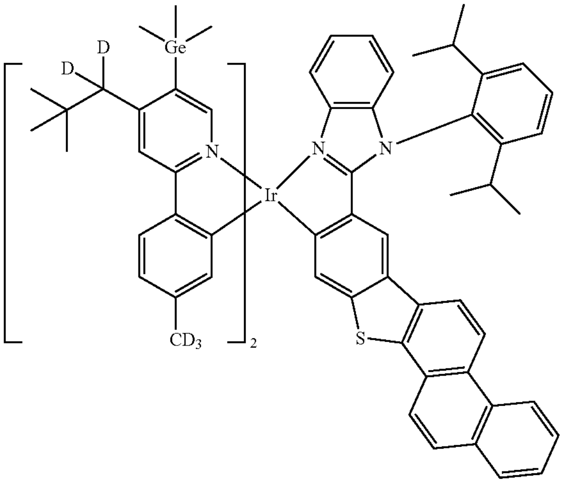
3311
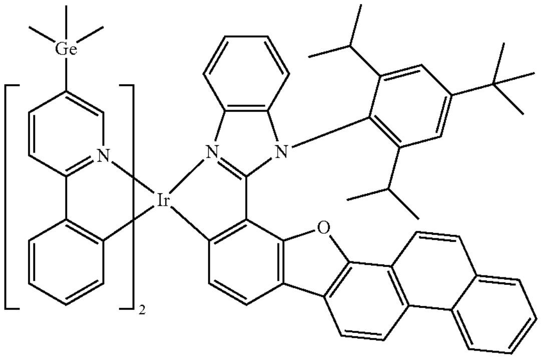
-continued
3312
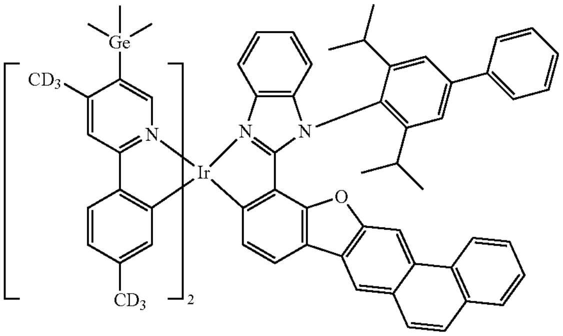
3313
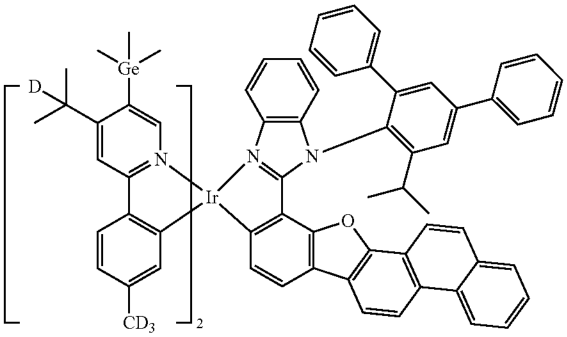
3314
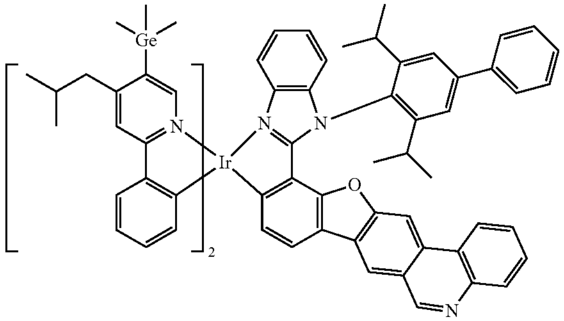
3315
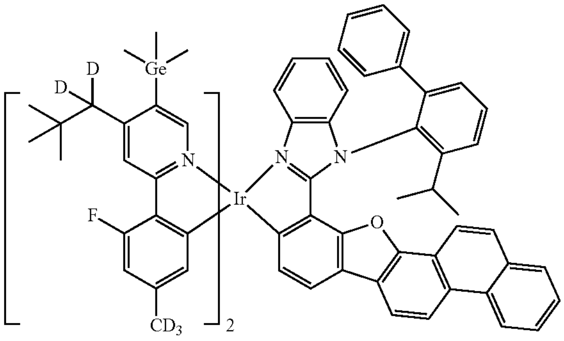

-continued
3316
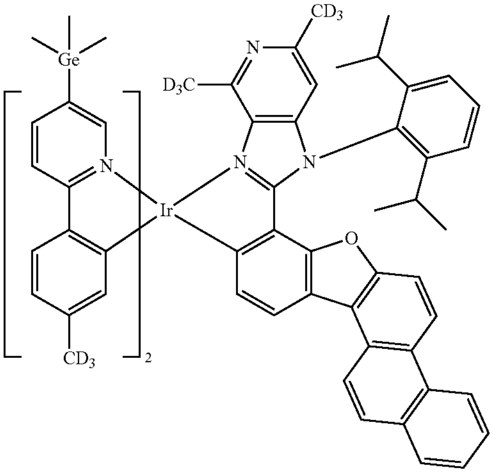
3317
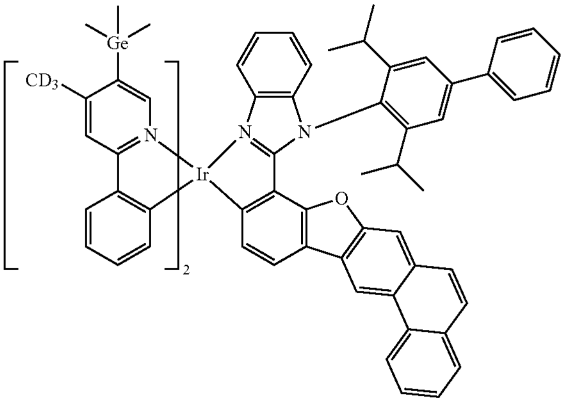
3318
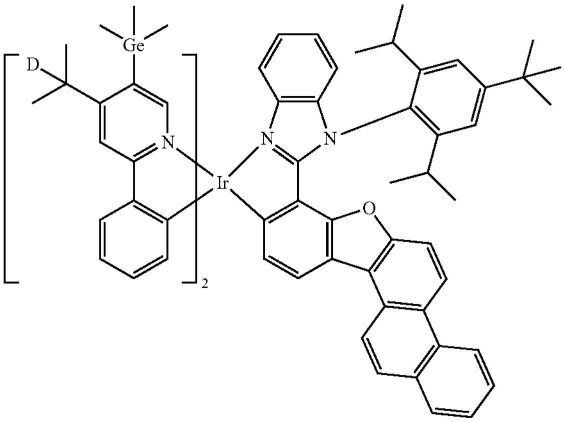
-continued
3319
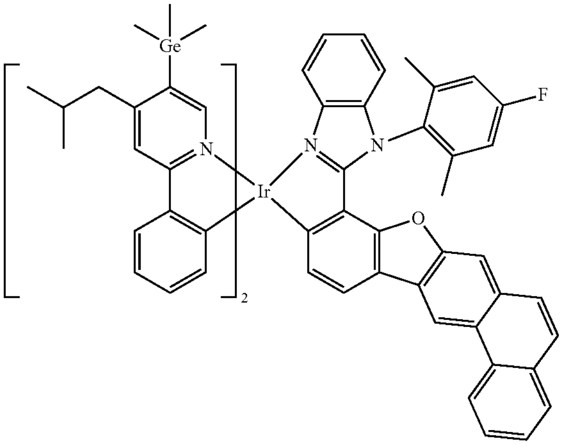
3320
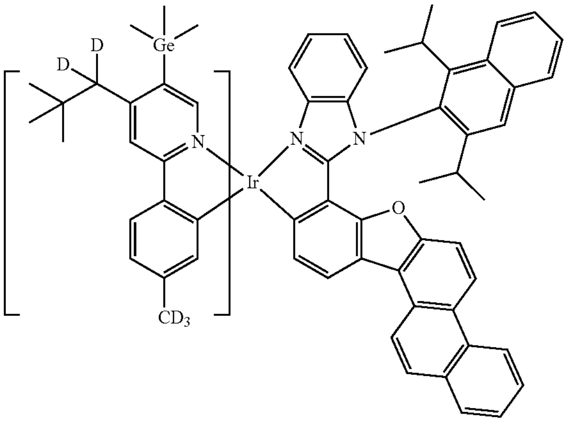
3321
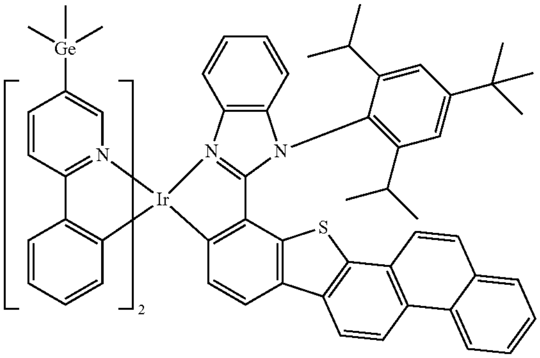
3322
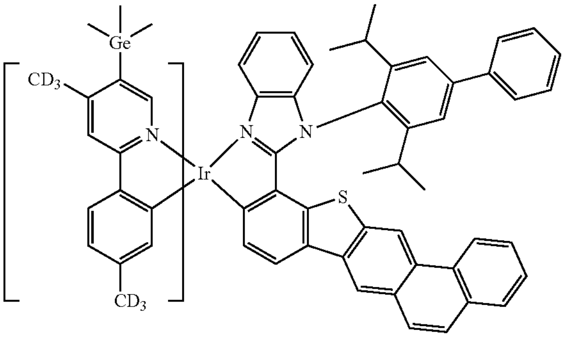

-continued
3323
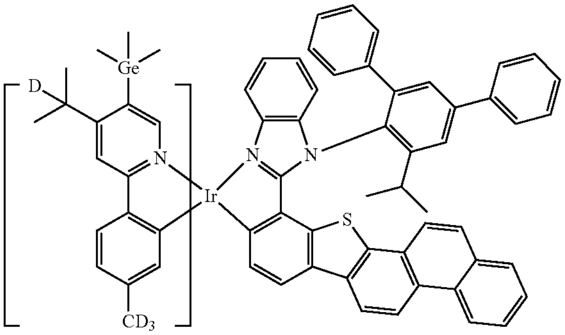
3324
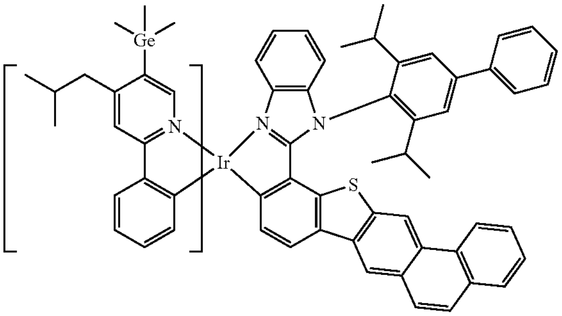
3325
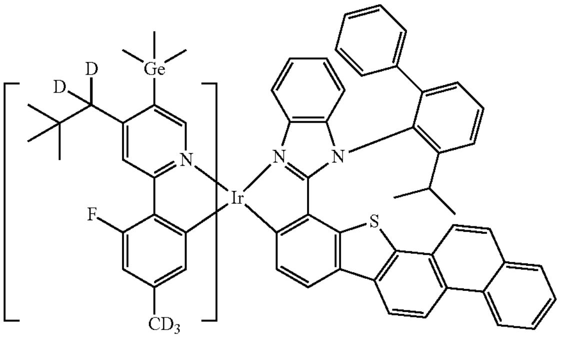
3326
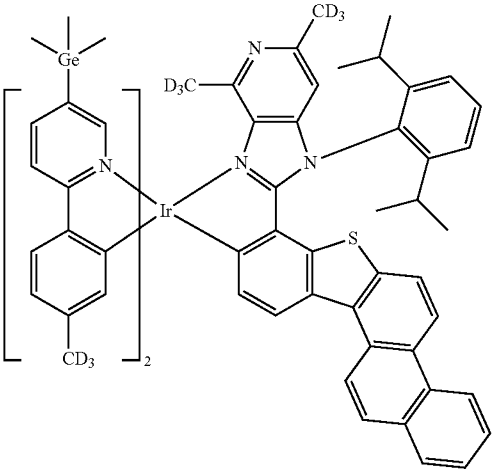
-continued
3327
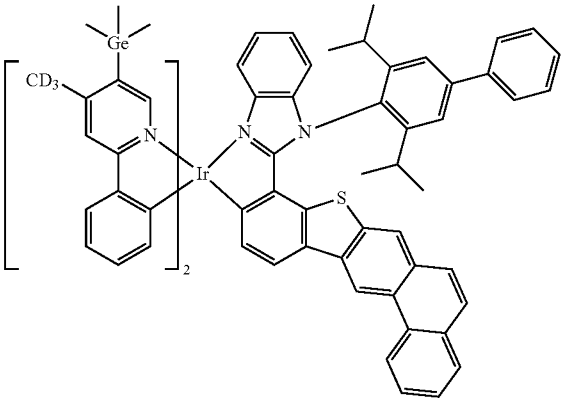
3328
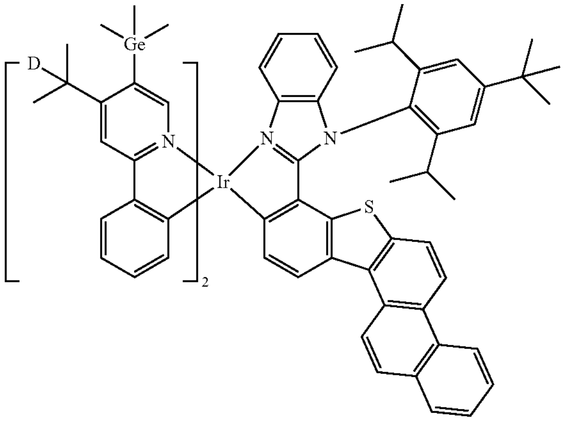
3329
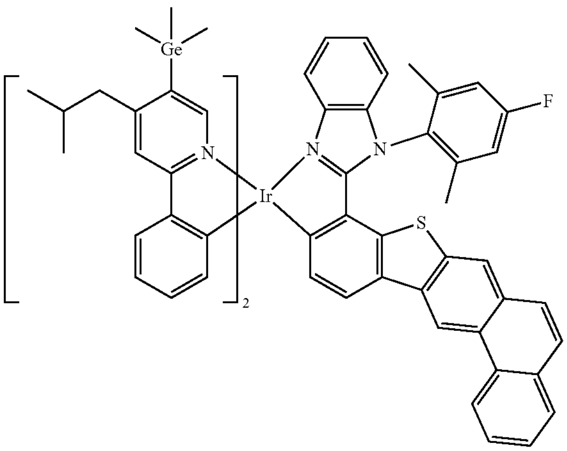

-continued
3330
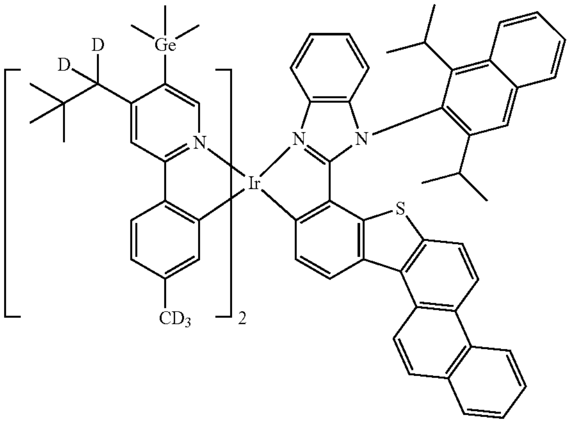
3331
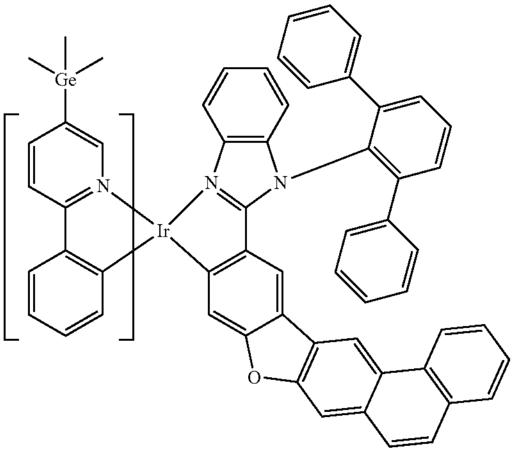
3332
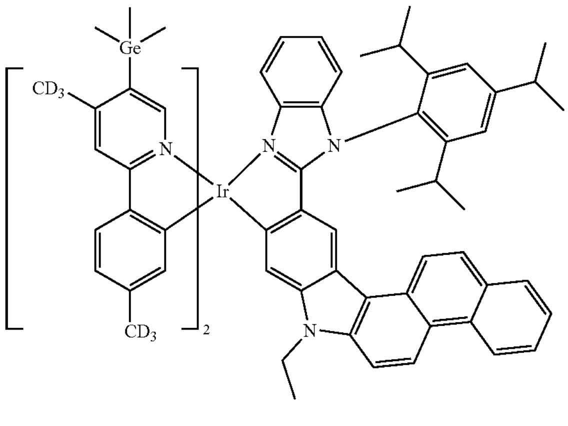
-continued
3333
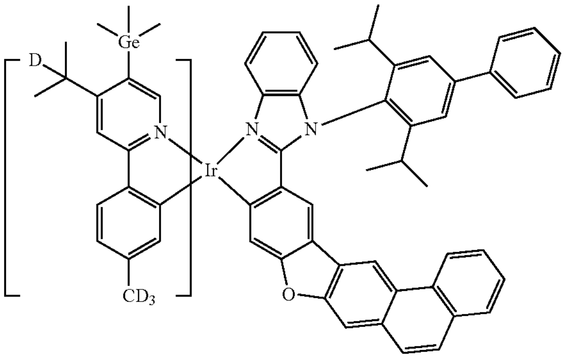
3334
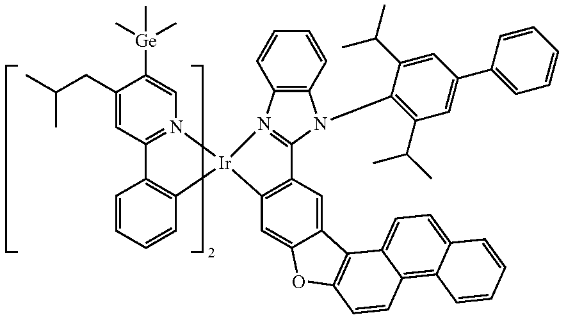
3335
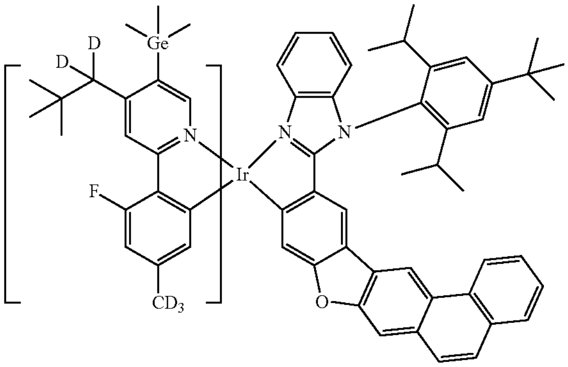
3336
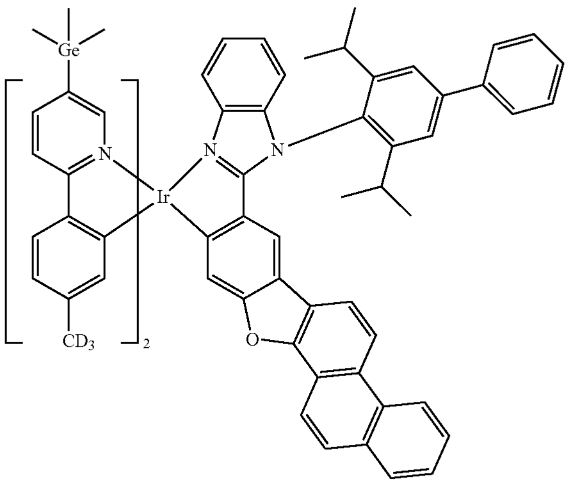

3337
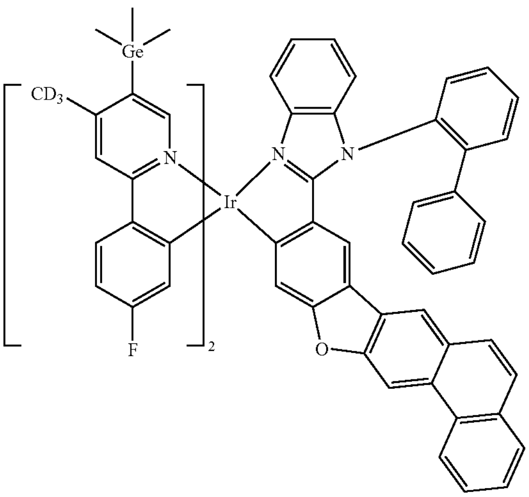
3340
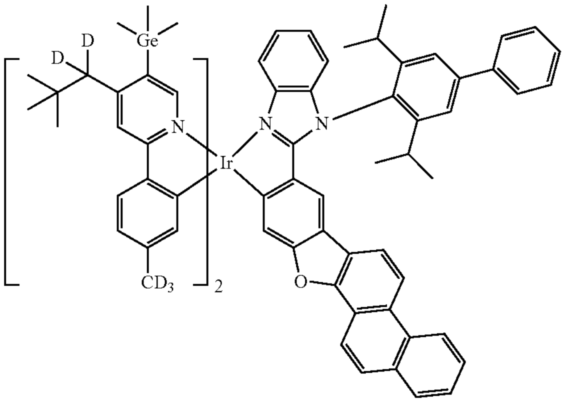
3338
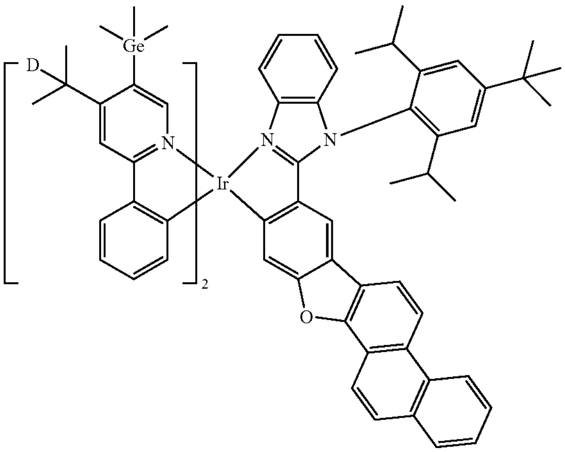
3341
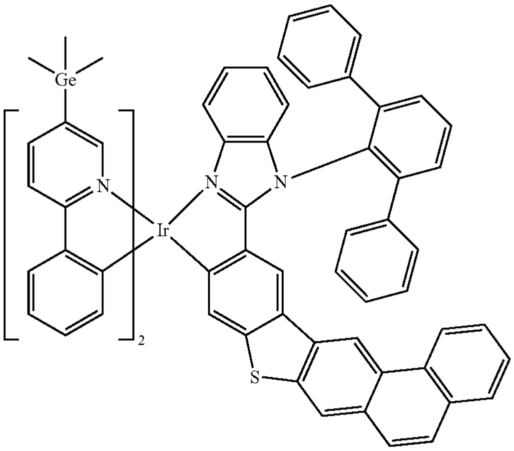
3339
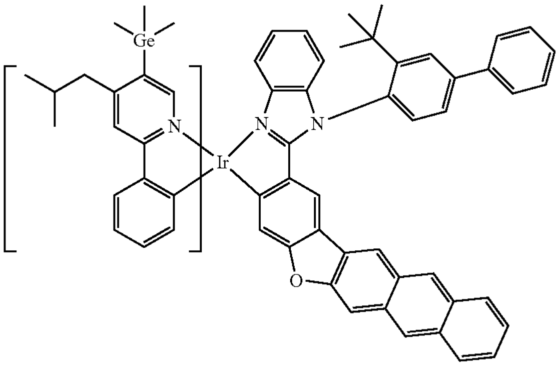
3342
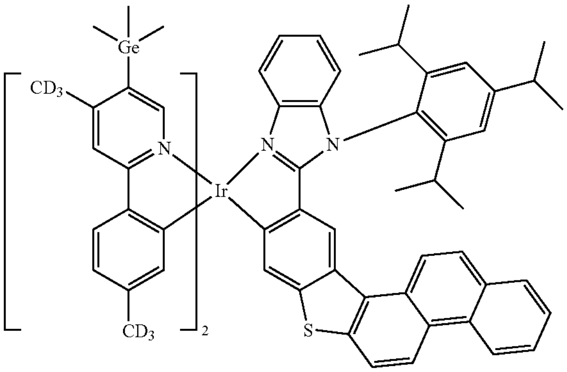

-continued
3343
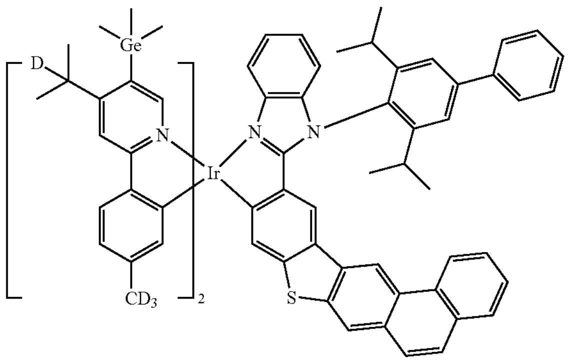
3344
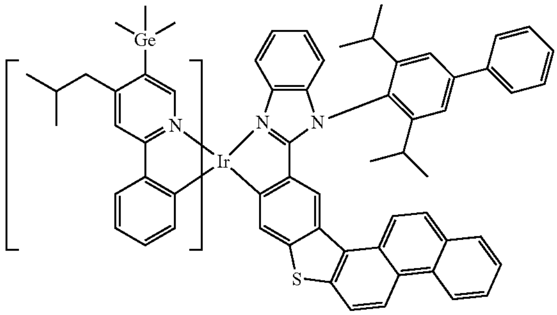
3345
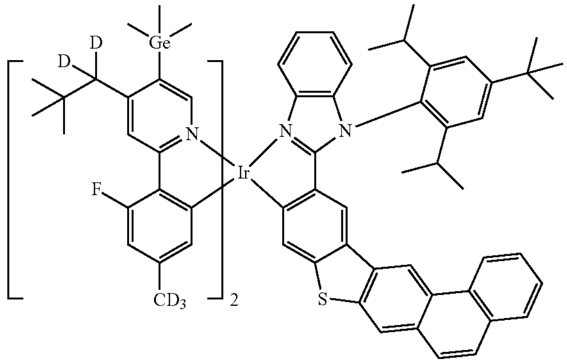
3346
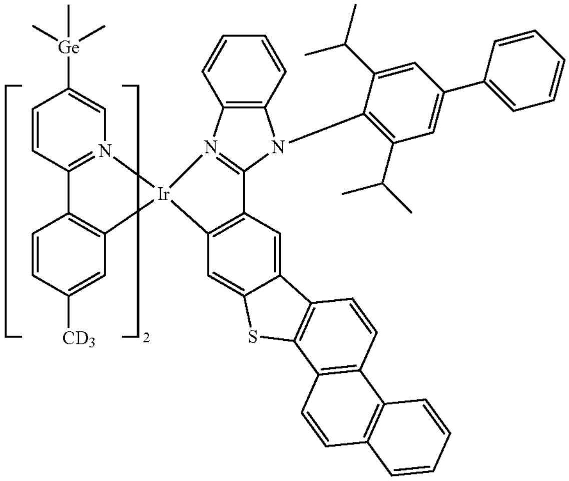
-continued
3347
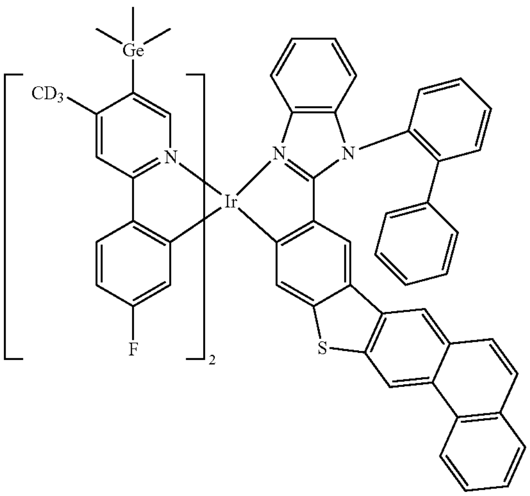
3348
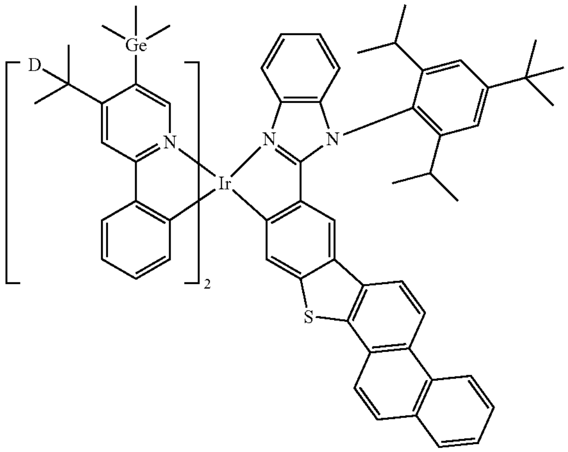
3349
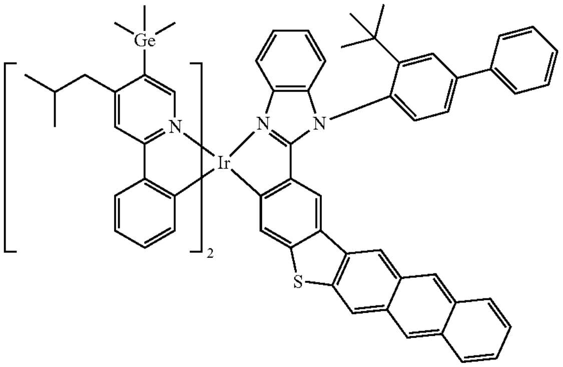

-continued
3350
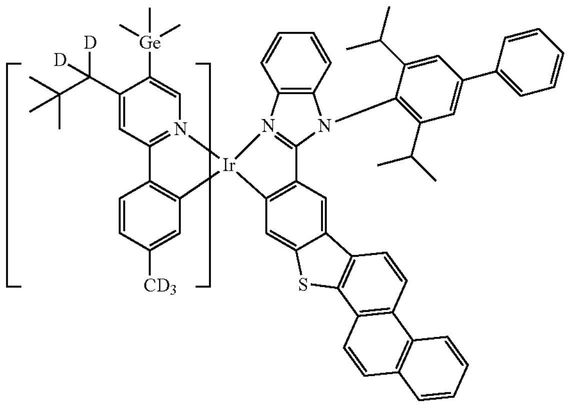
Group 1-4
1
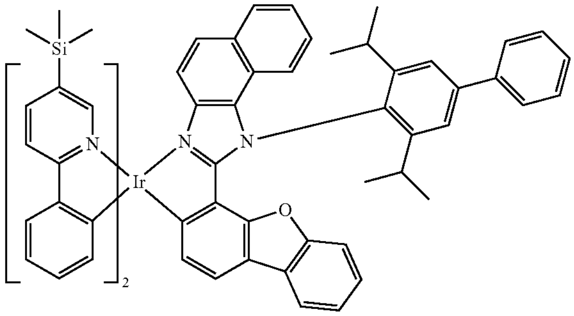
2
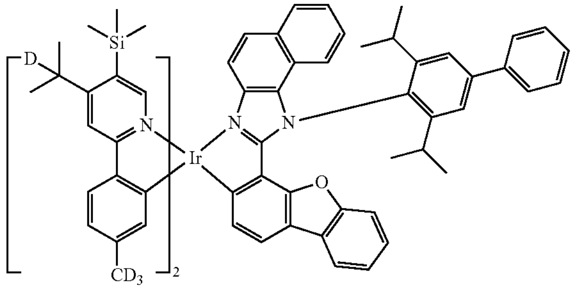
3
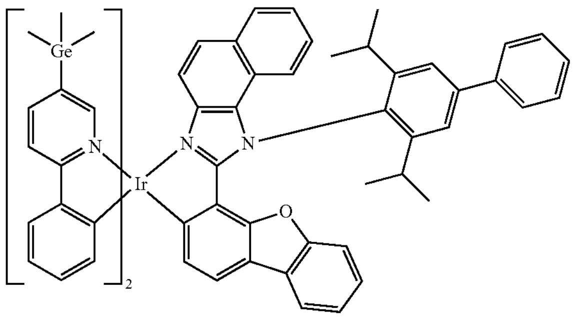
-continued
4
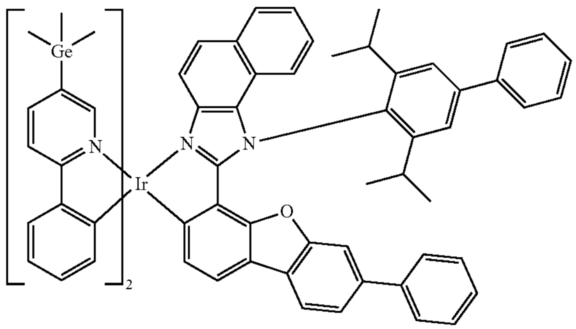
5
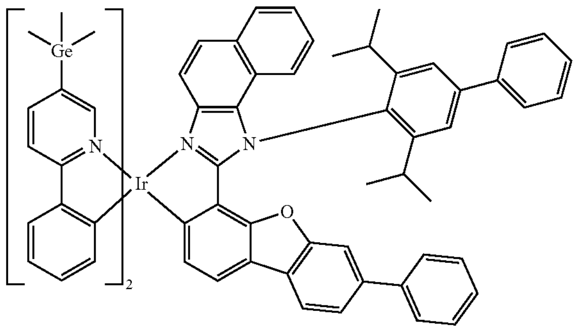
6
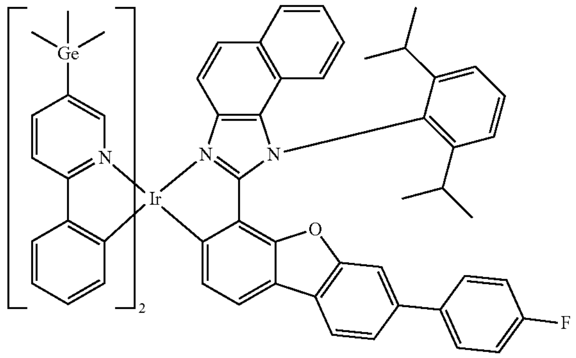
7
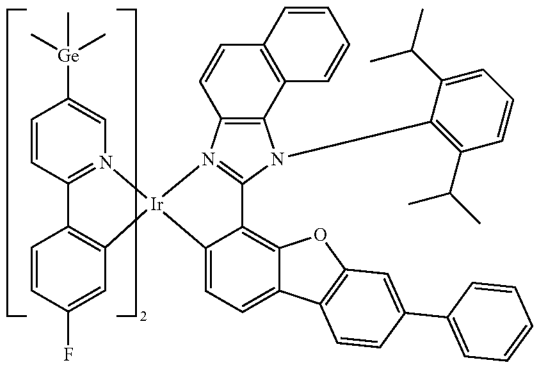

-continued
8
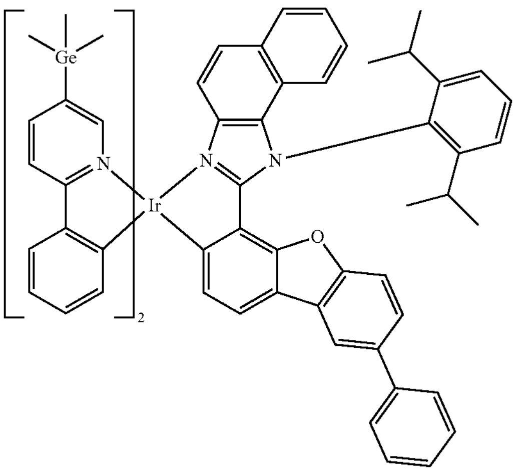
9
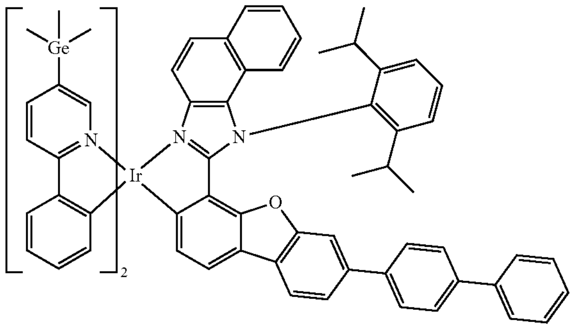
10
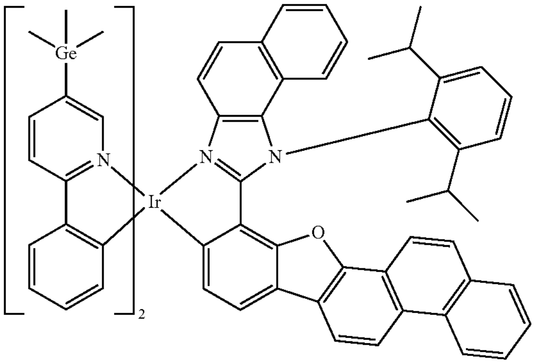
11
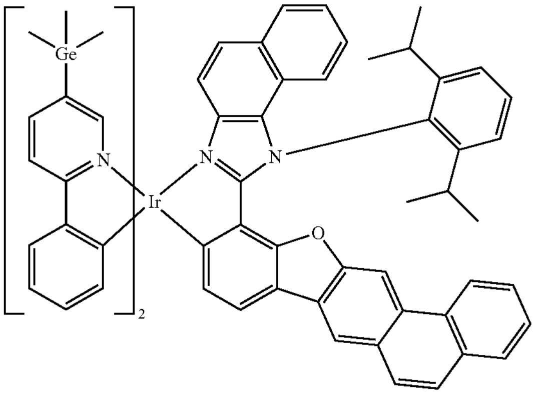
-continued
12
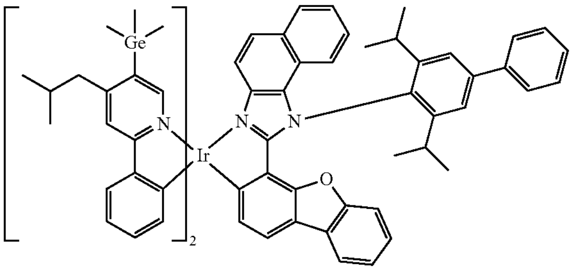
13
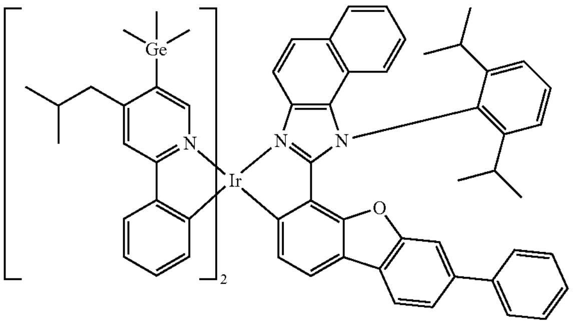
14
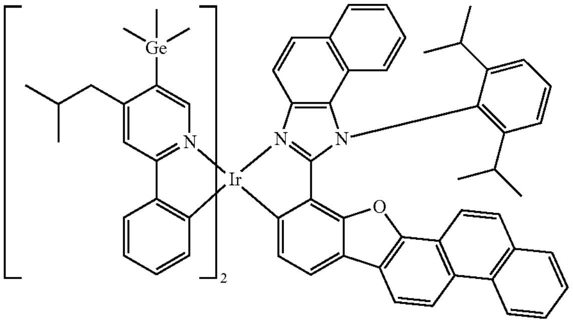
15
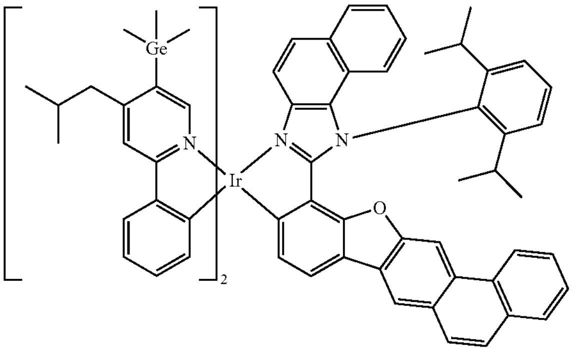

Group 1-5
1
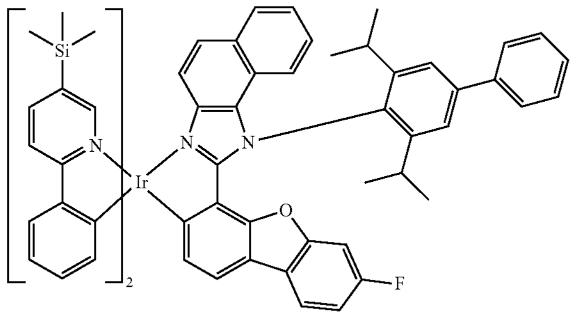
2
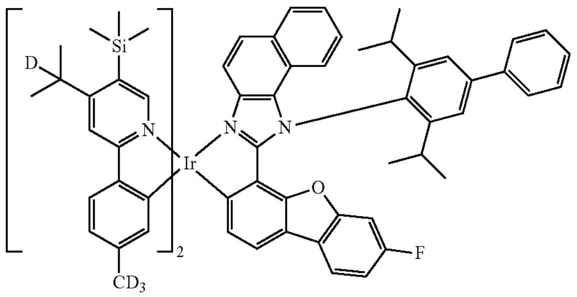
3
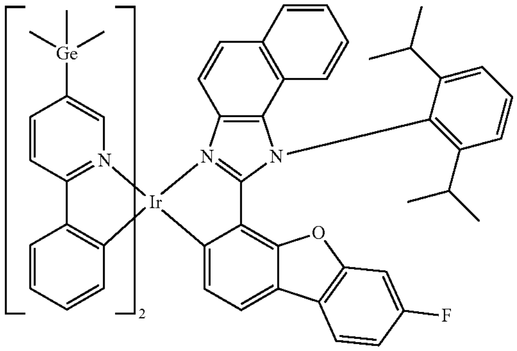
4
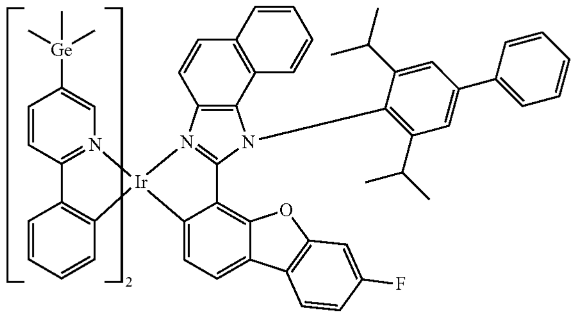
5
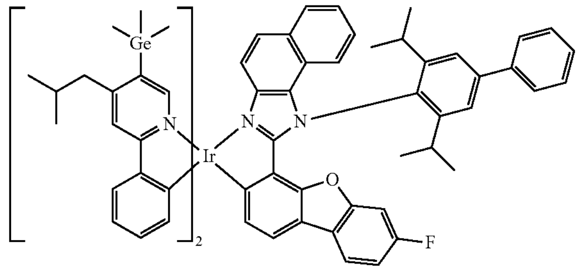
Group 1-6
1
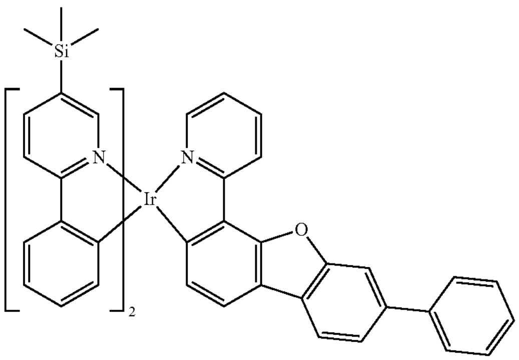
2
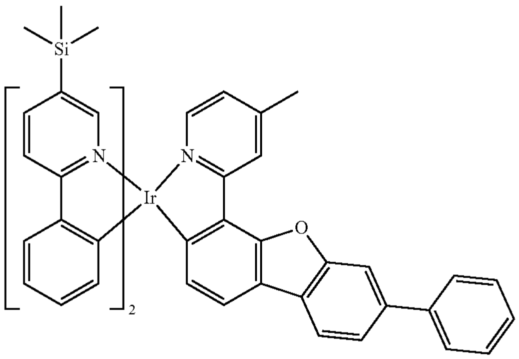
3
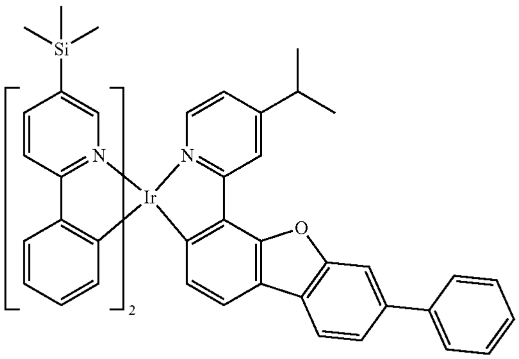

-continued
4
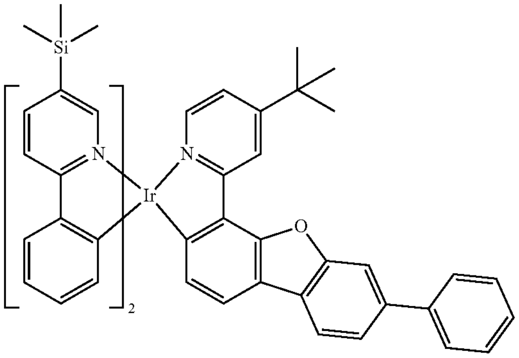
5
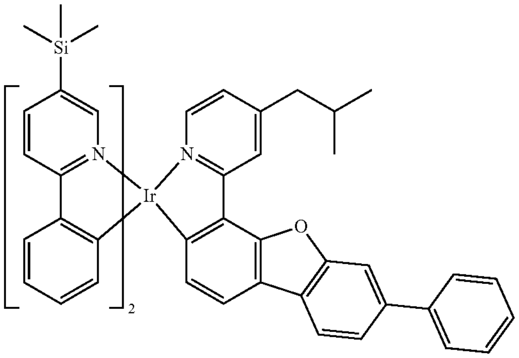
6
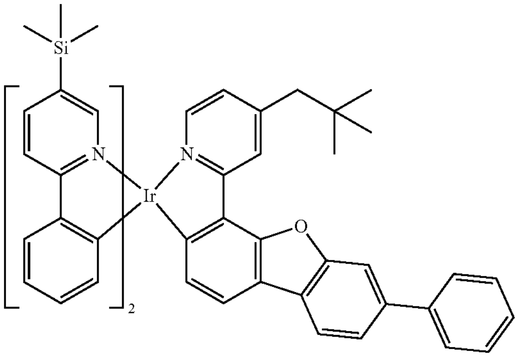
7
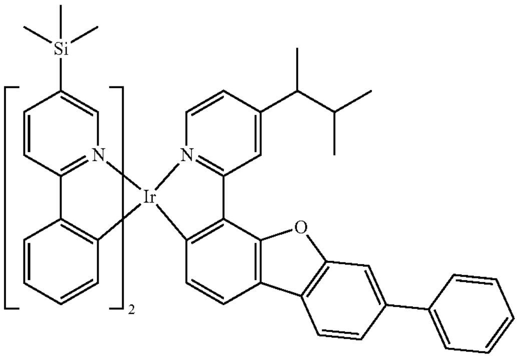
-continued
8
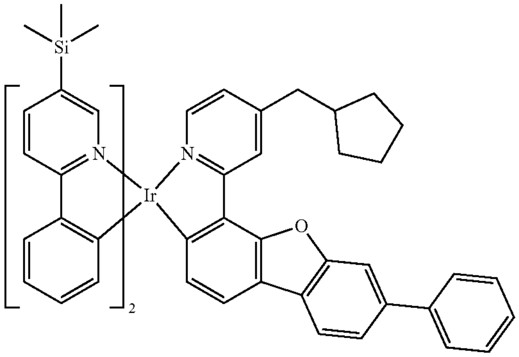
9
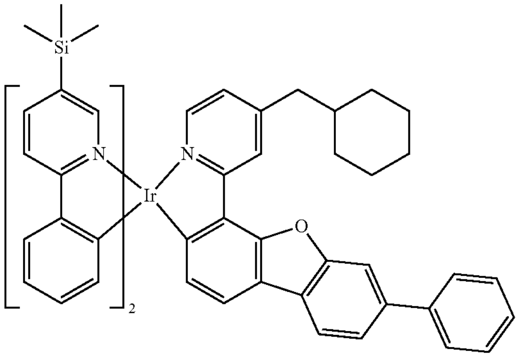
10
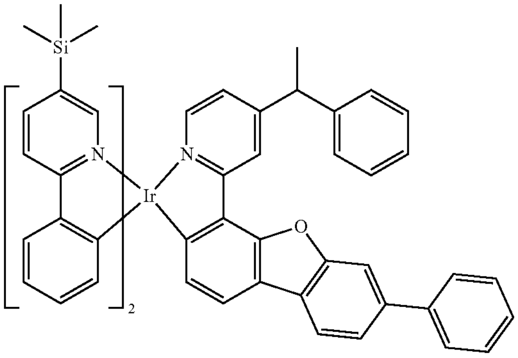
11
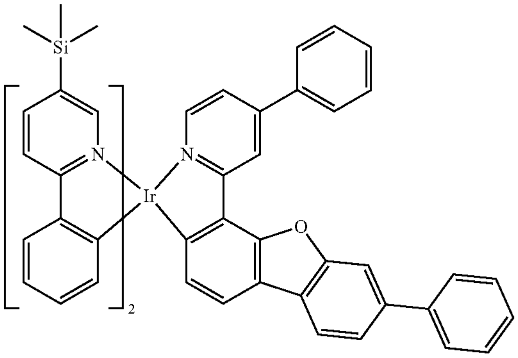

-continued
12
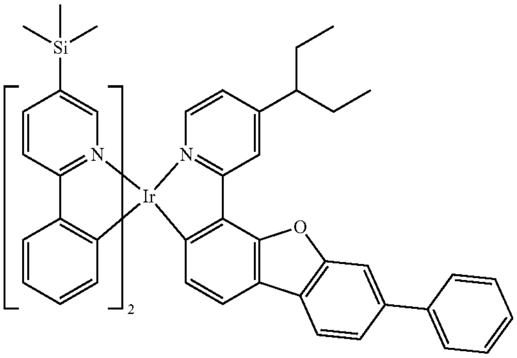
13
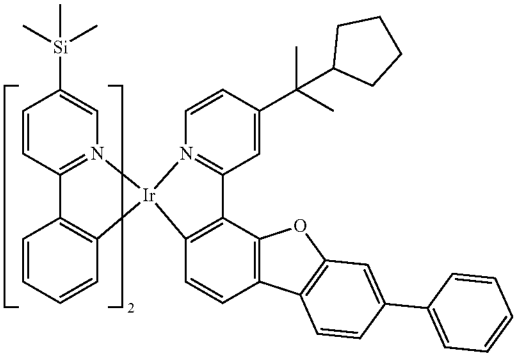
14
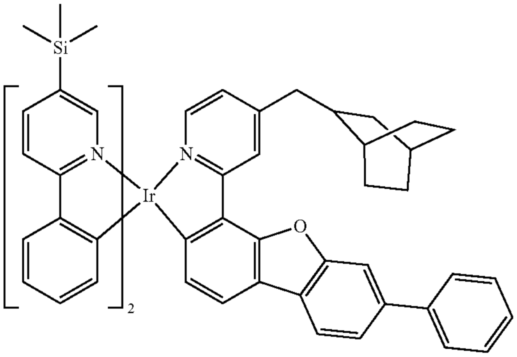
15
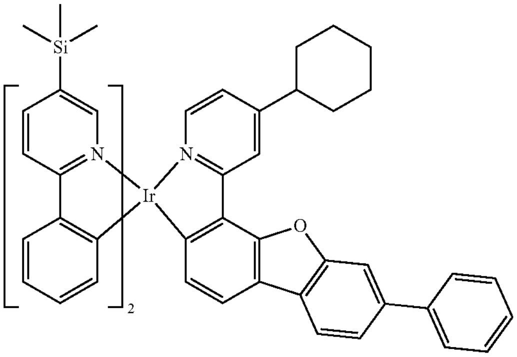
-continued
16
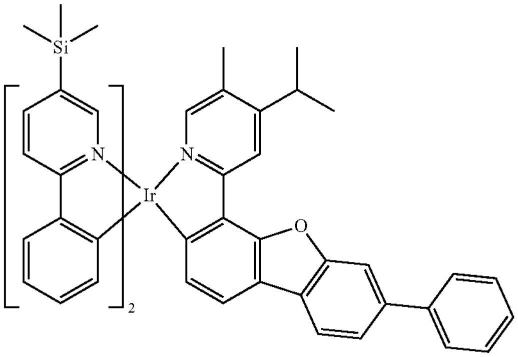
17
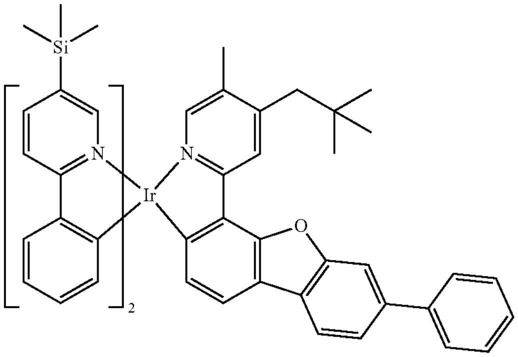
18
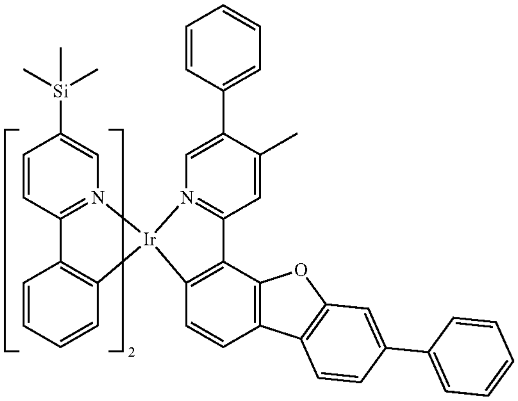
19
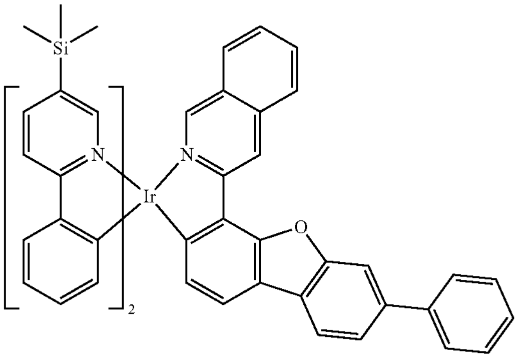

-continued
20
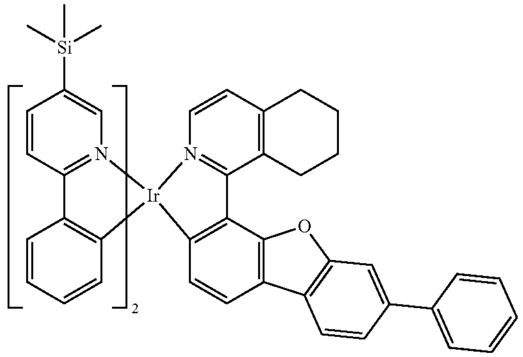
21
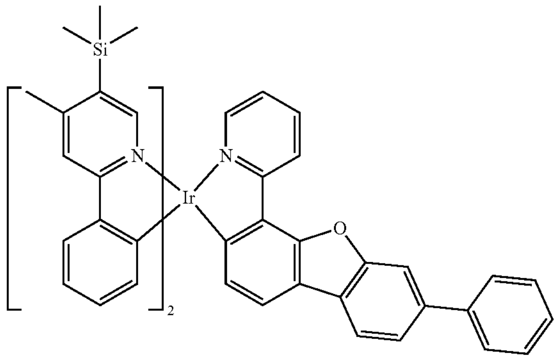
22
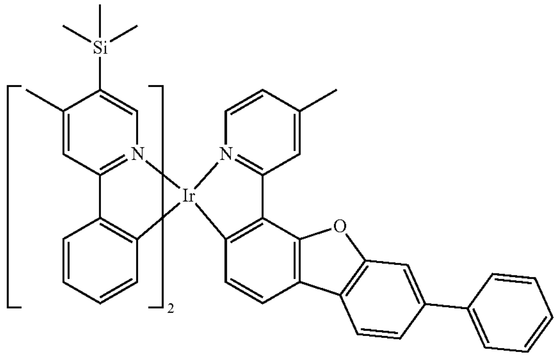
23
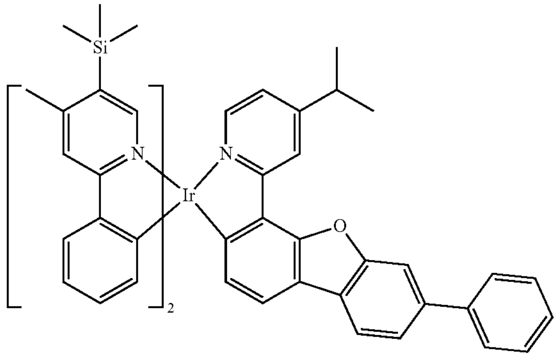
-continued
24
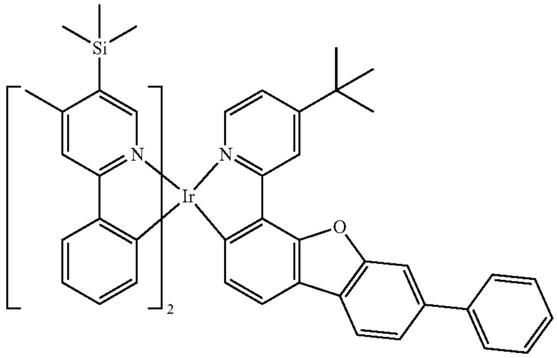
25
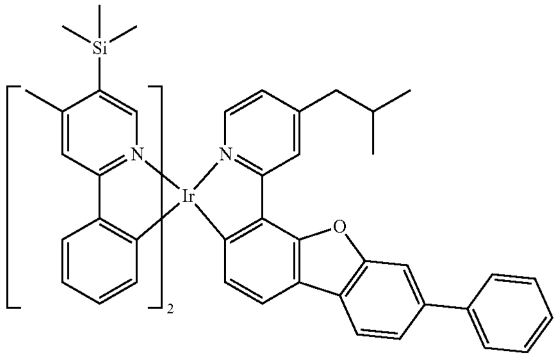
26
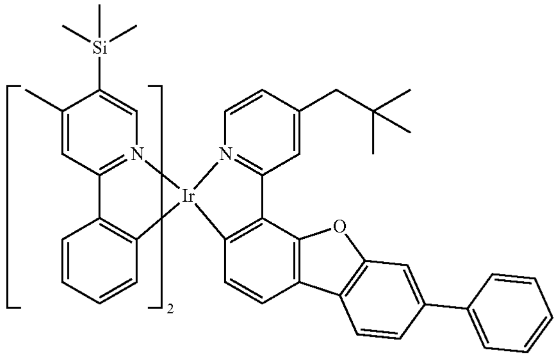
27
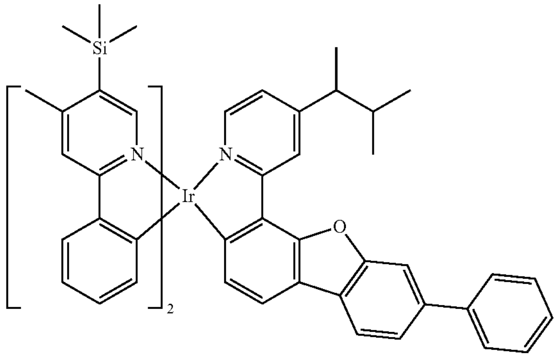

-continued
28
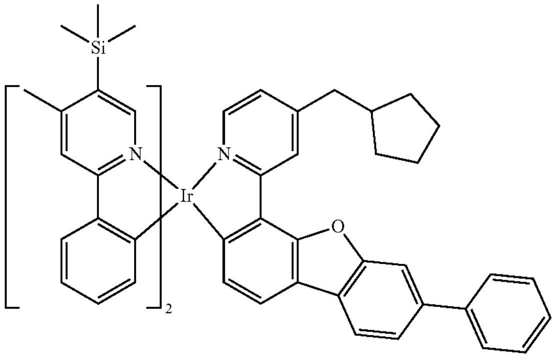
29
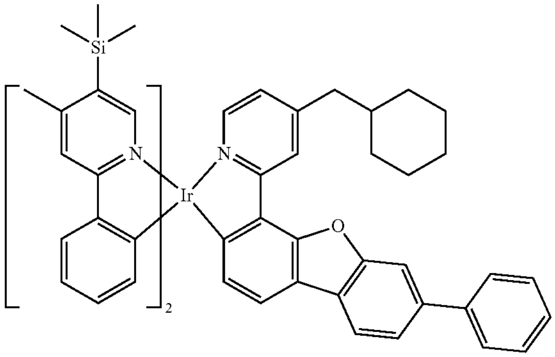
30
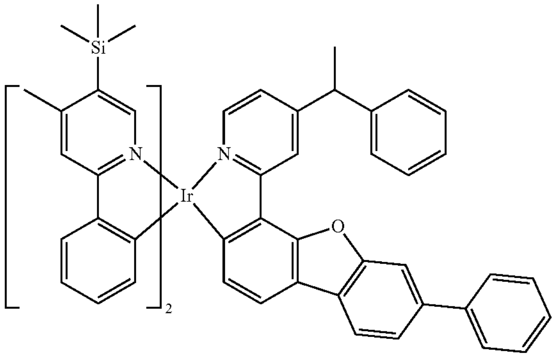
31
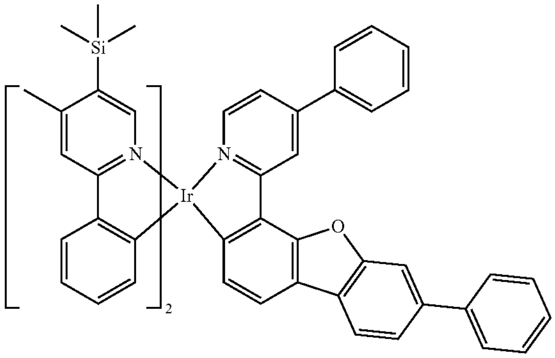
-continued
32
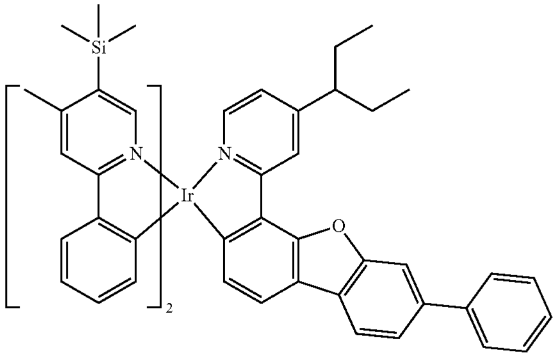
33
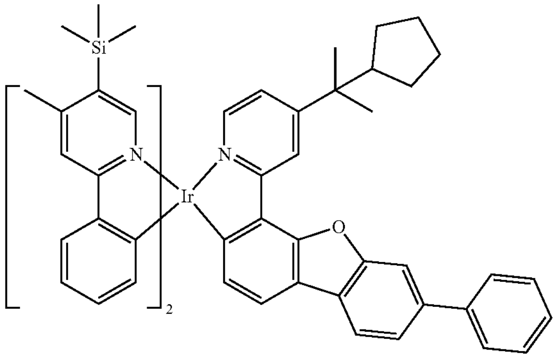
34
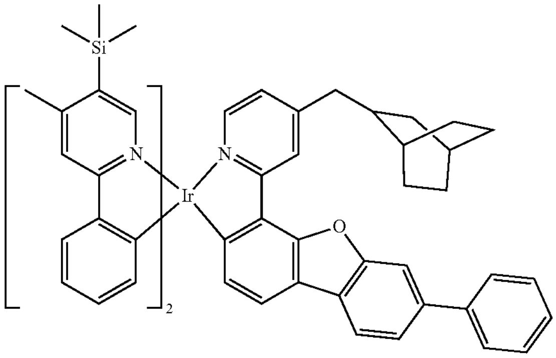
35
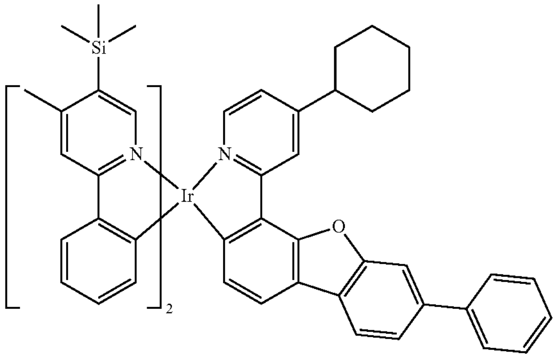

-continued
36
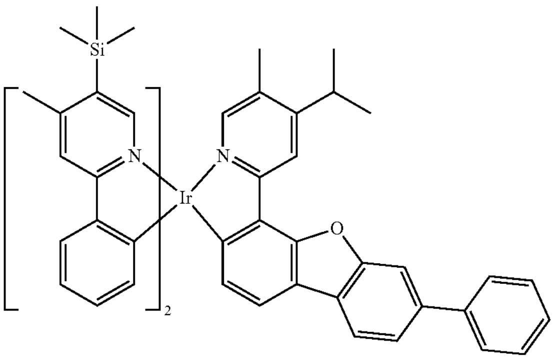
37
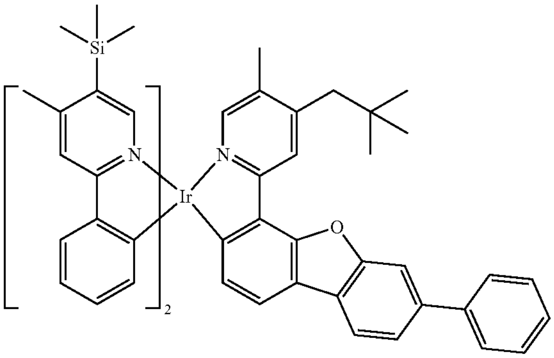
38
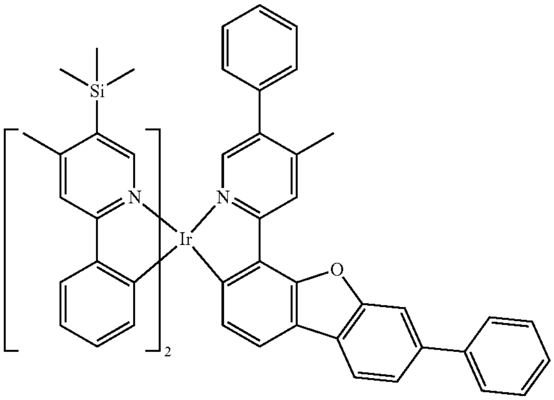
39
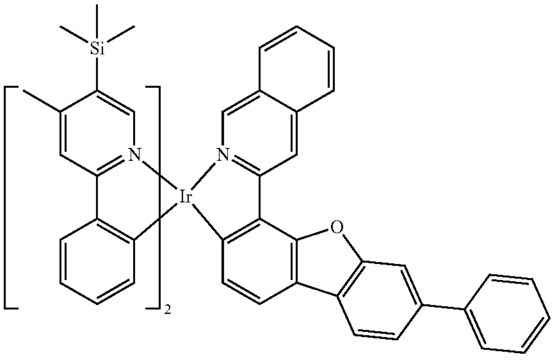
-continued
40
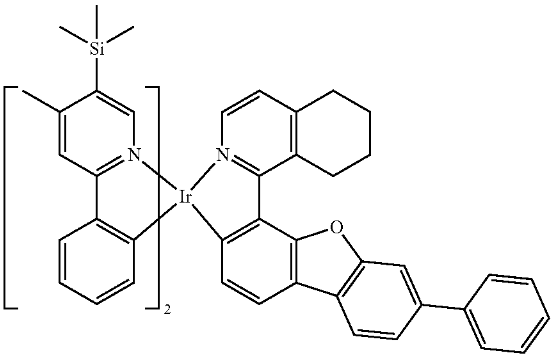
41
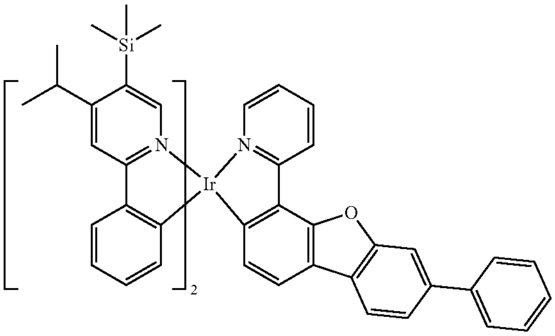
42
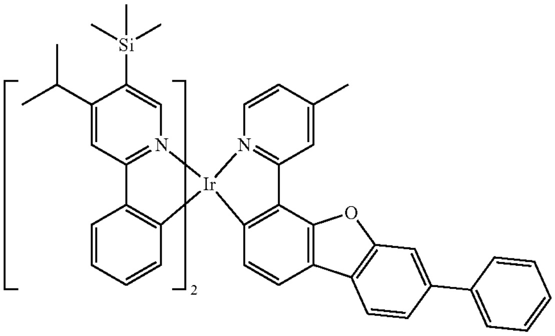
43
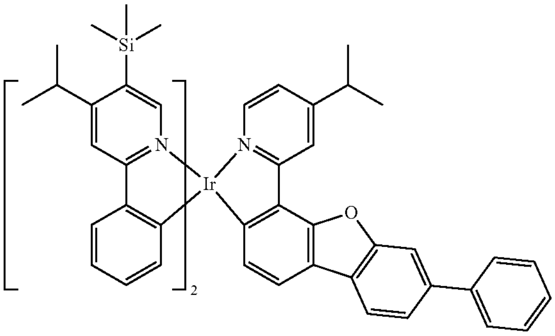

-continued
44
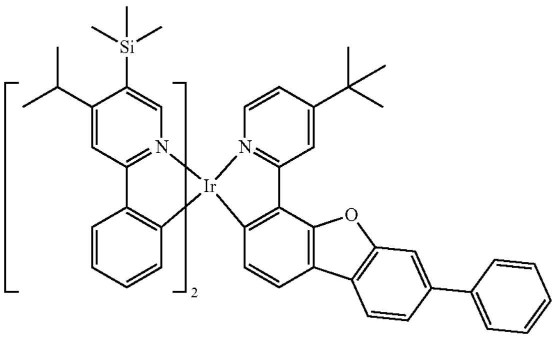
45
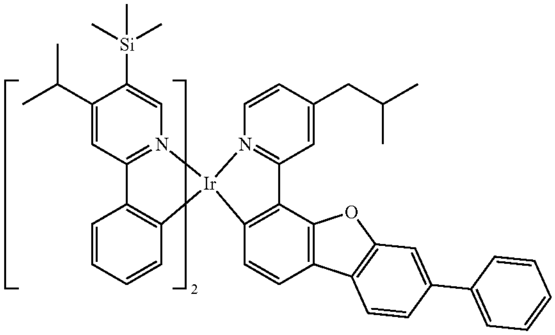
46
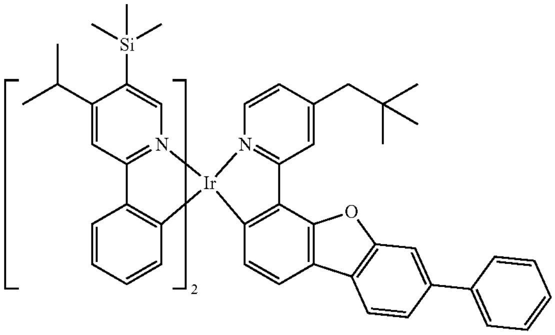
47
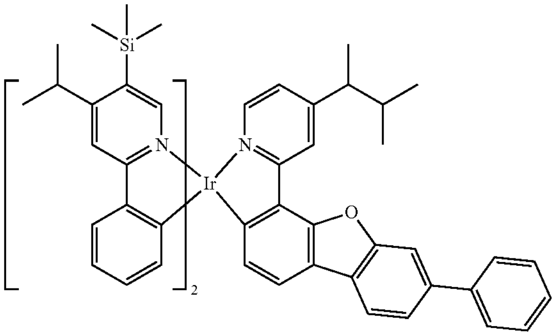
-continued
48
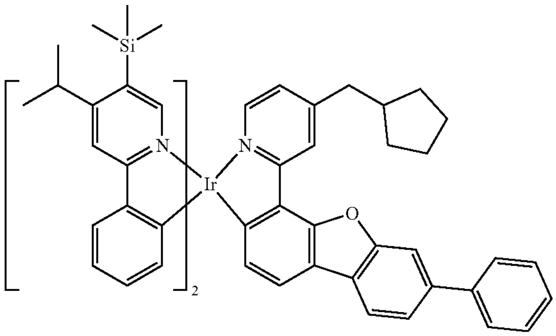
49
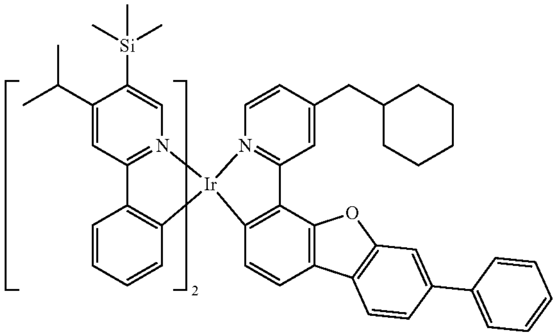
50
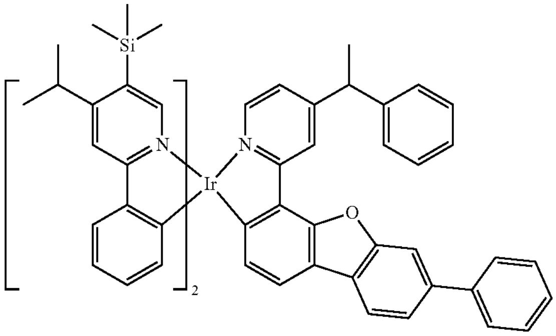
51
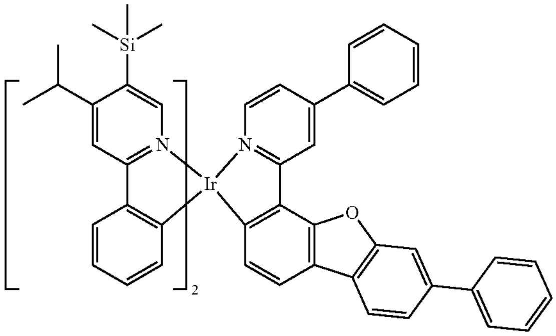

-continued
52
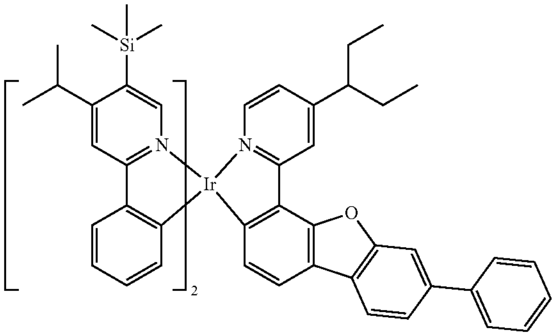
53
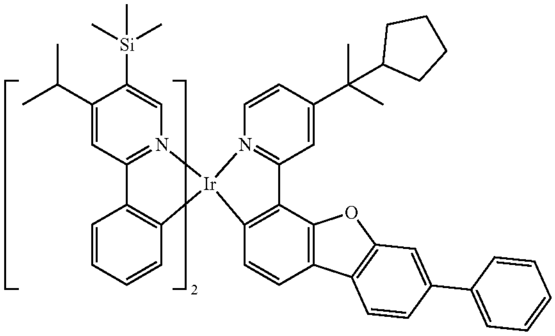
54
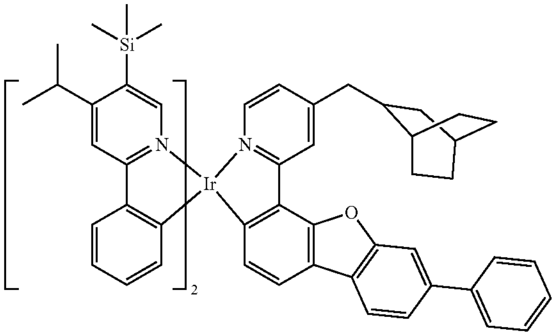
55
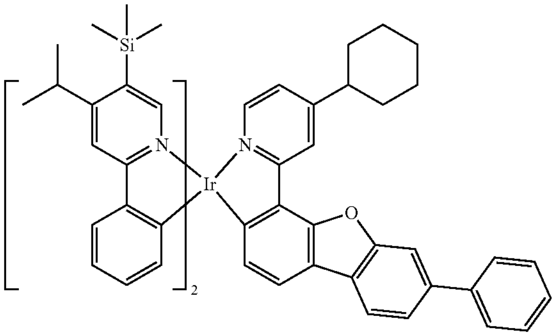
-continued
56
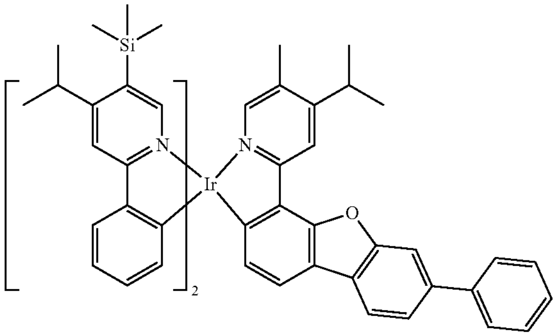
57
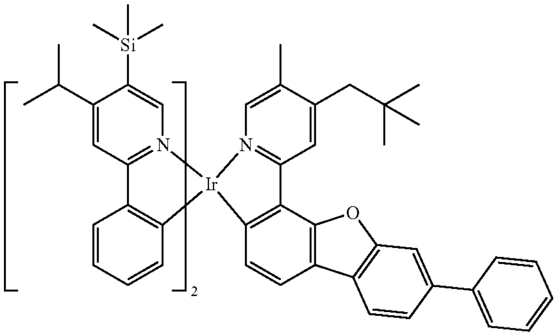
58
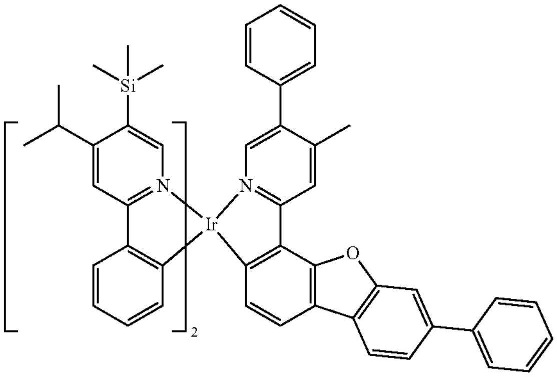
59
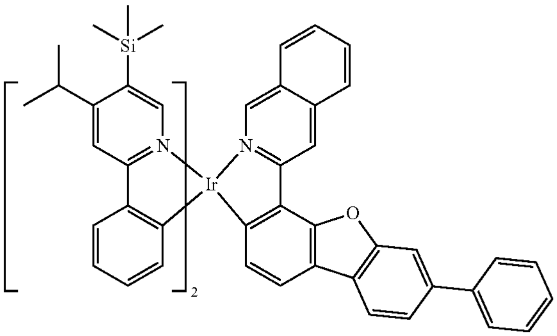

-continued
60
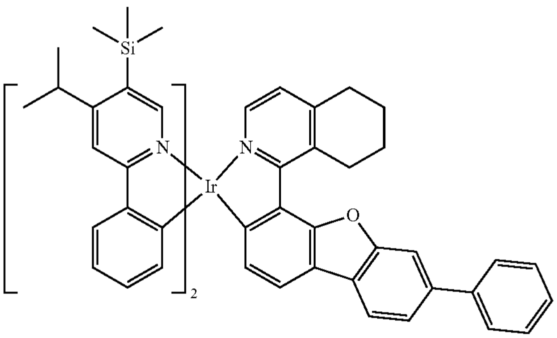
61
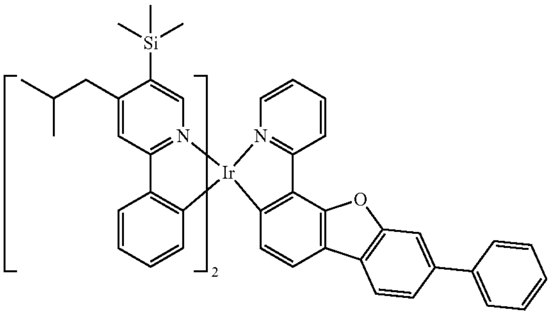
62
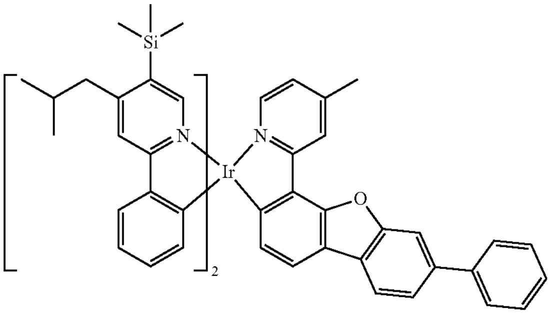
63
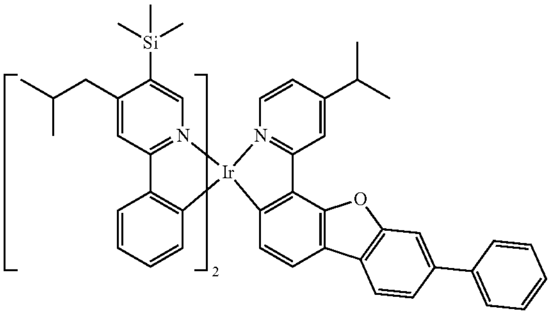
64
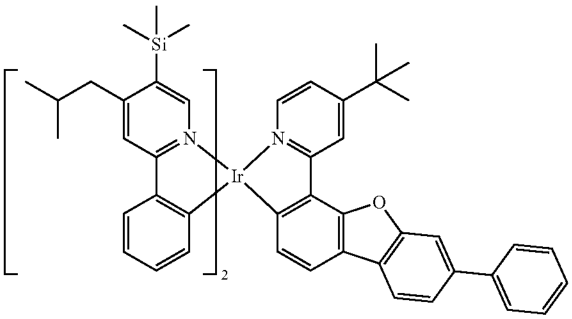
65
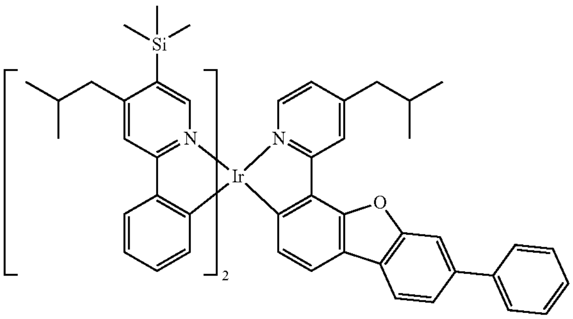
66
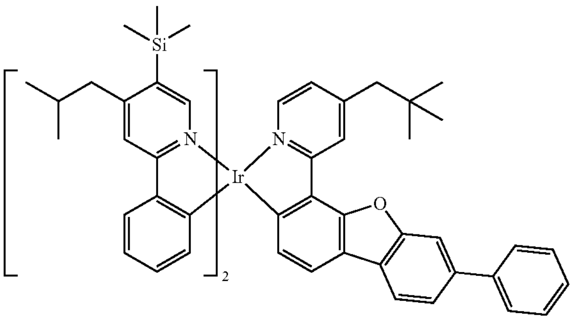
67
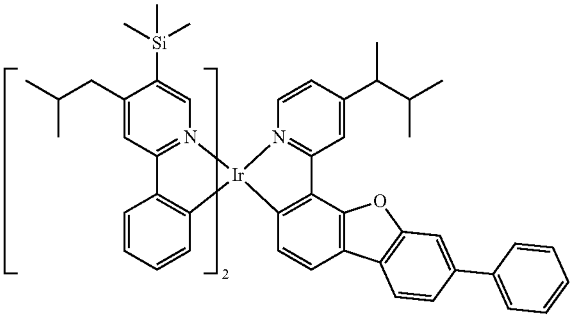

68
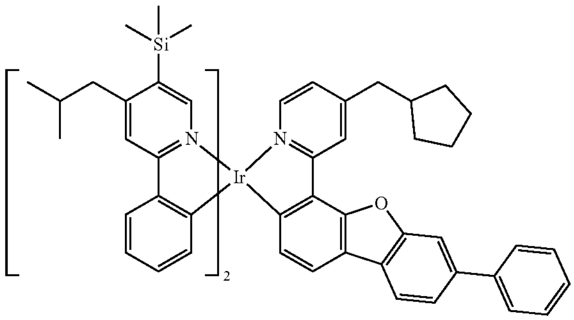
69
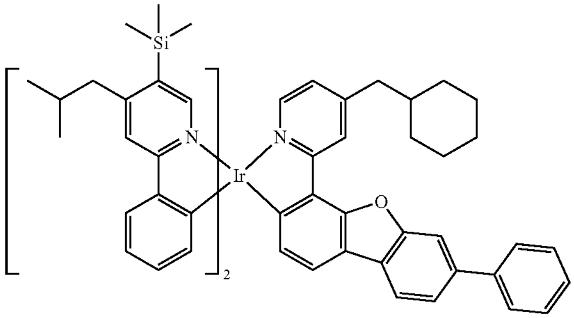
70
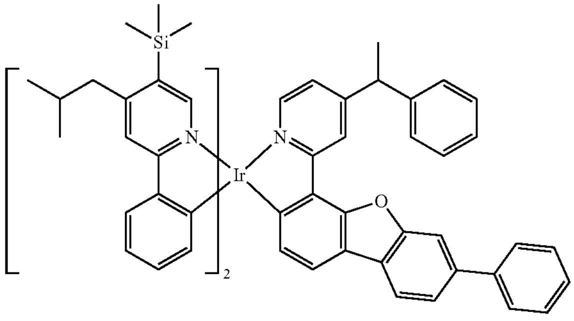
71
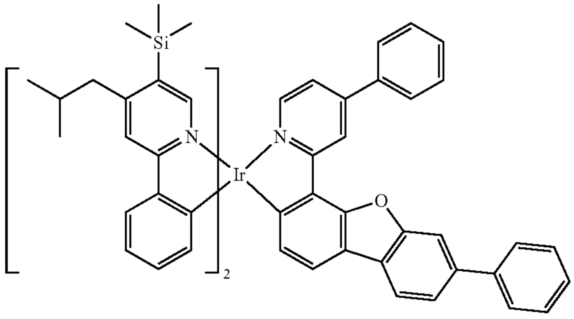
72
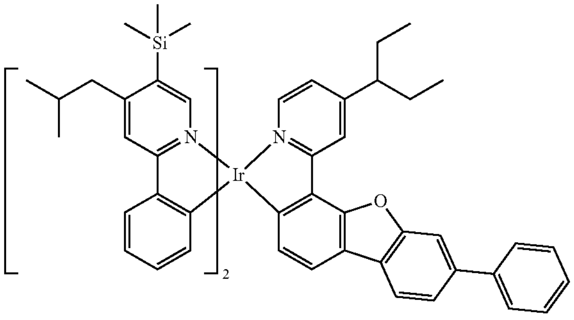
73
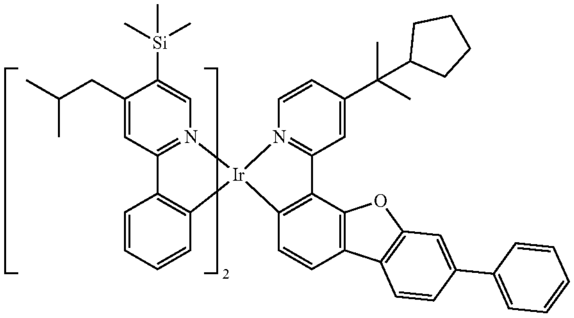
74
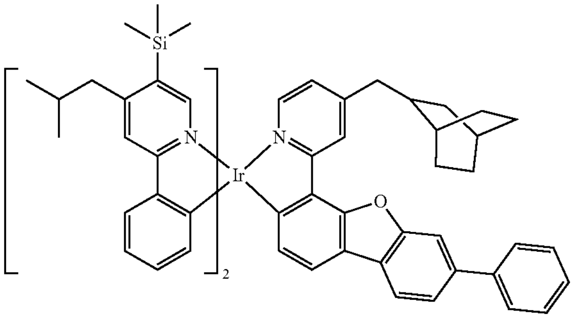
75
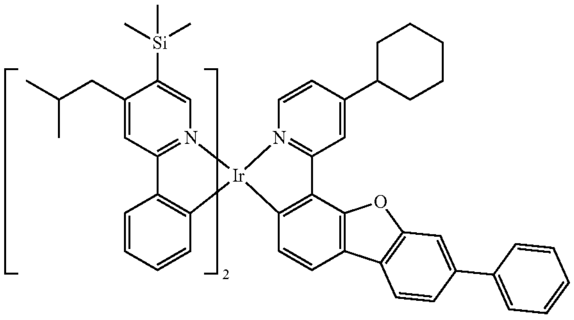

-continued
76
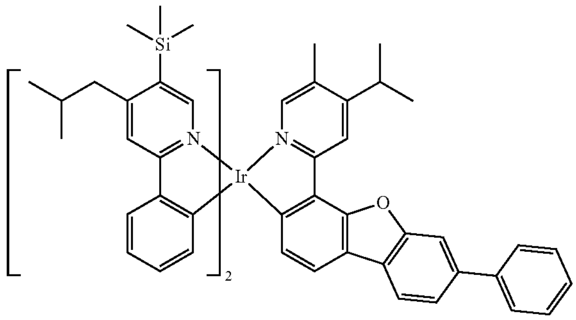
77
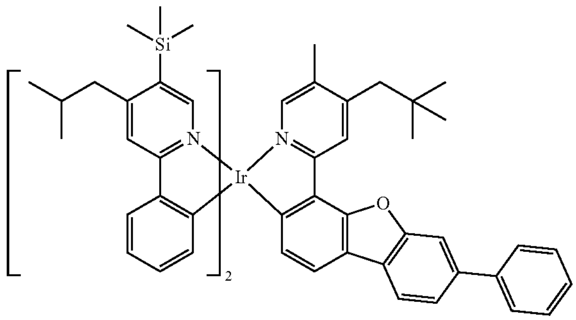
78
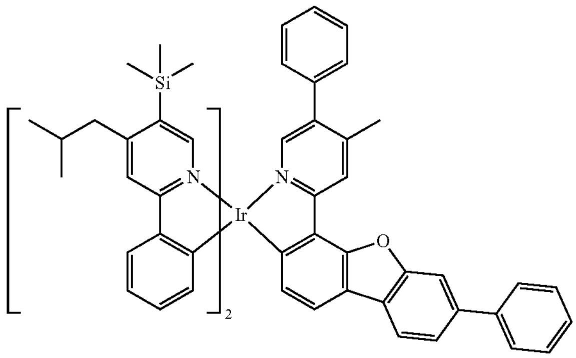
79
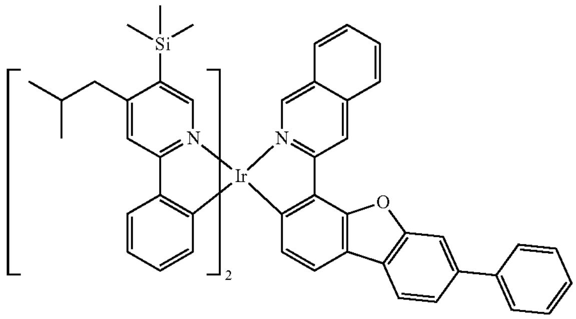
-continued
80
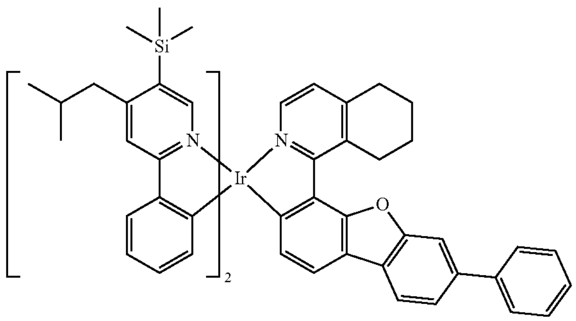
81
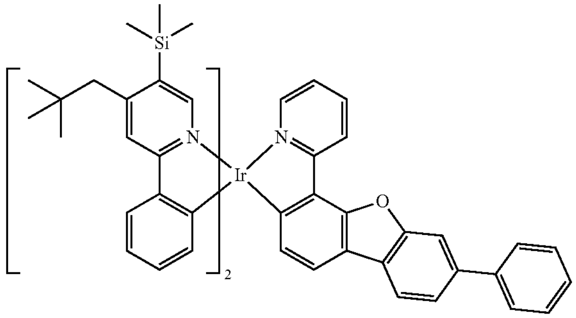
82
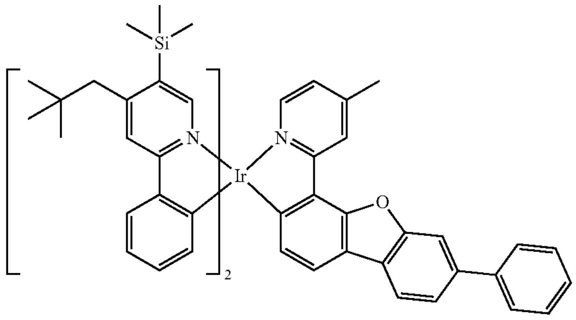
83
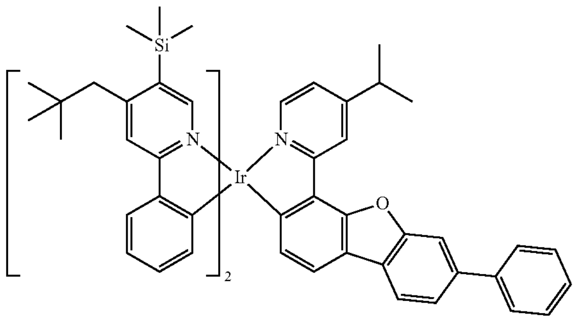

84
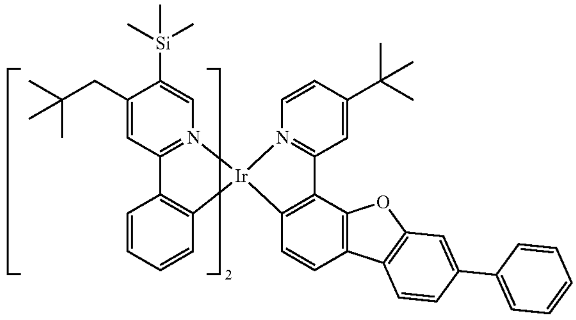
88
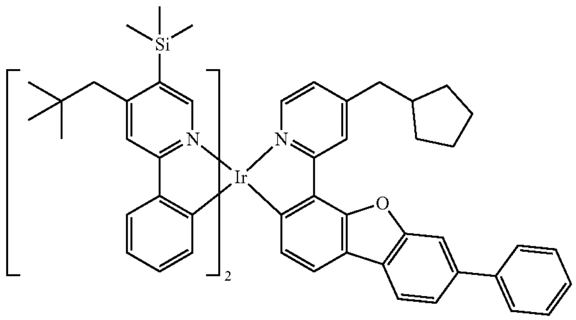
85
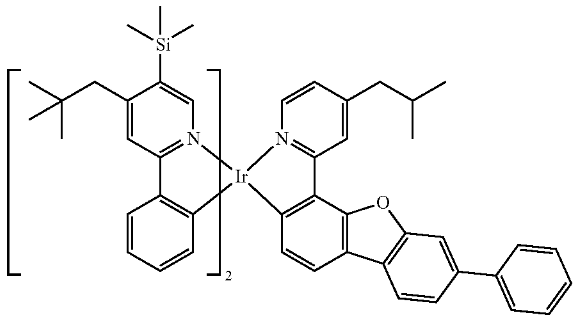
89
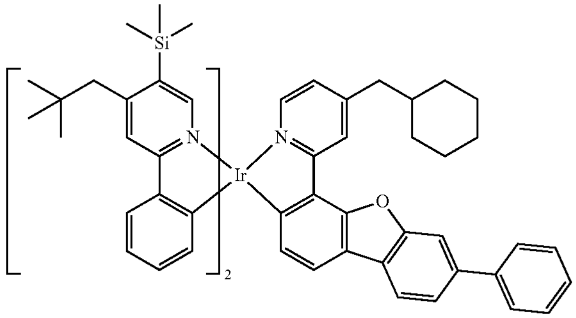
86
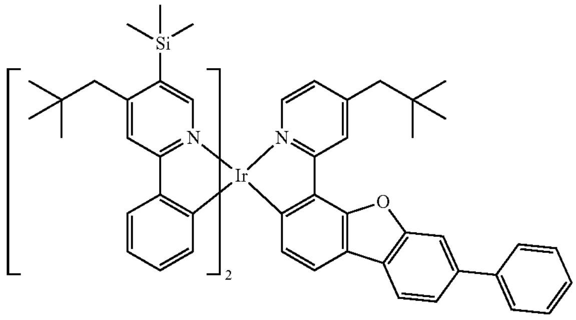
90
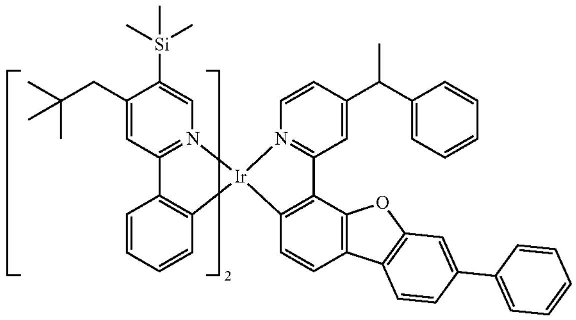
87
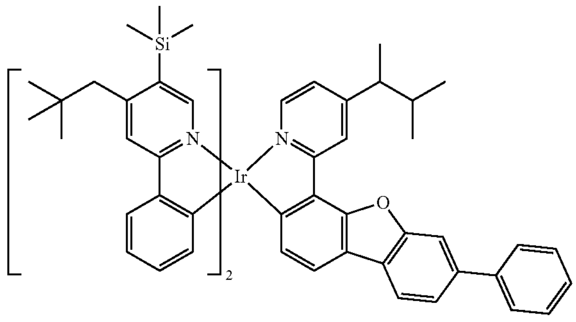
91
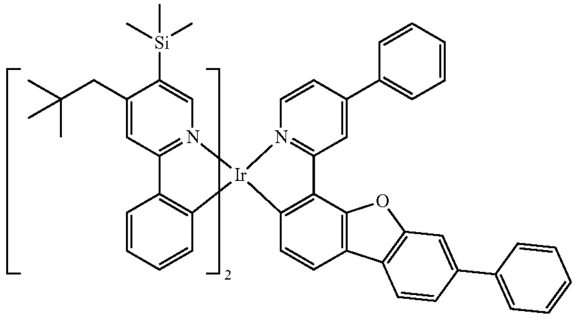

-continued
92
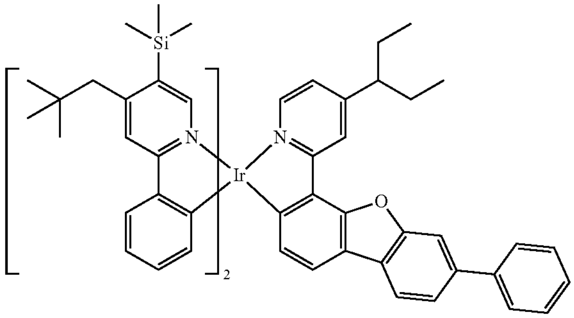
93
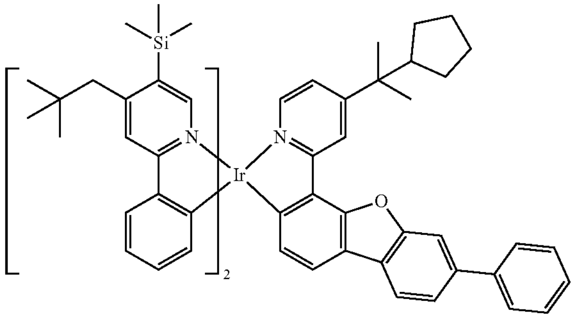
94
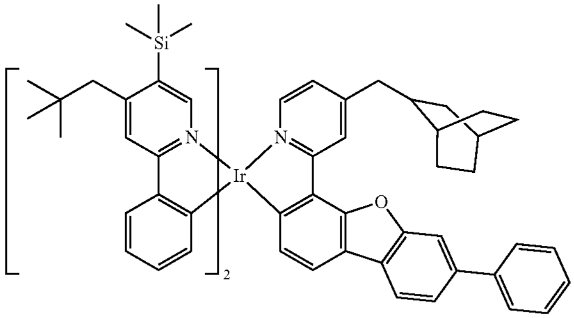
95
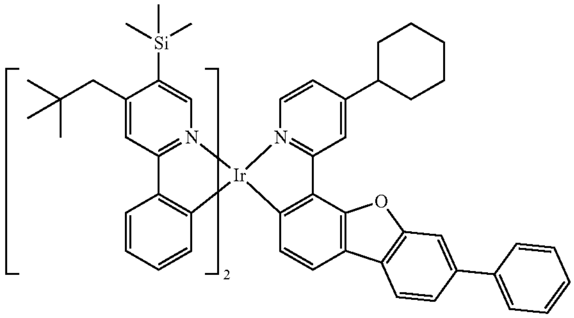
-continued
96
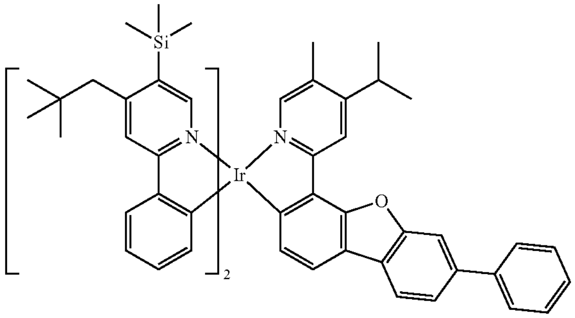
97
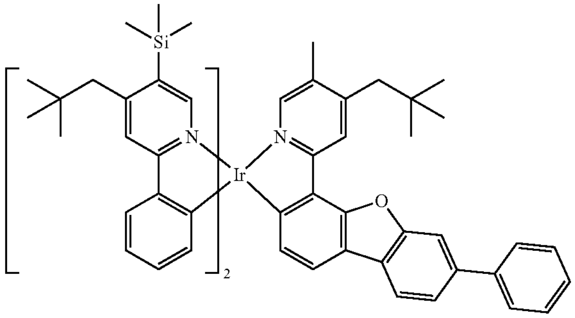
98
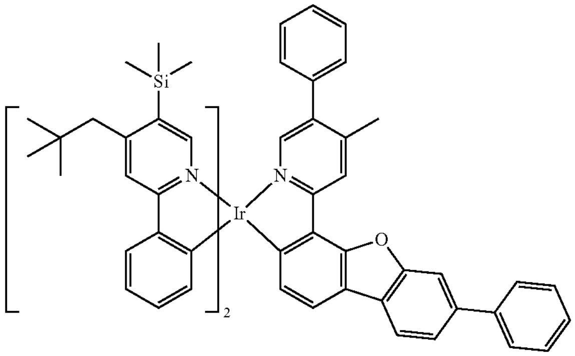
99
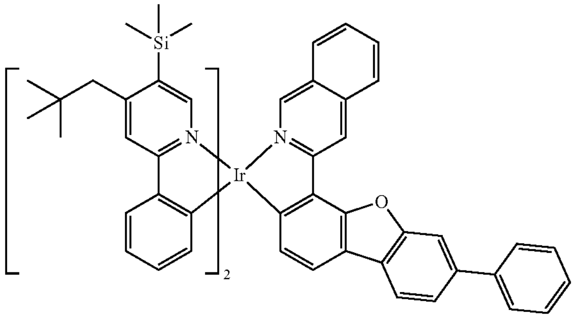

-continued
100
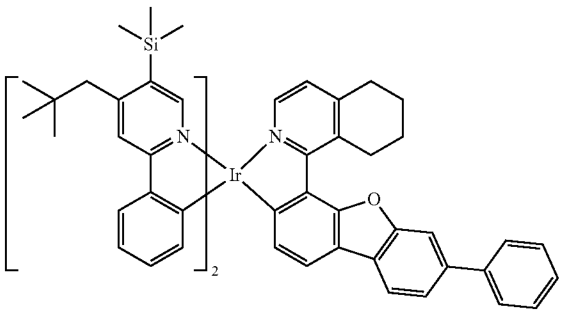
101
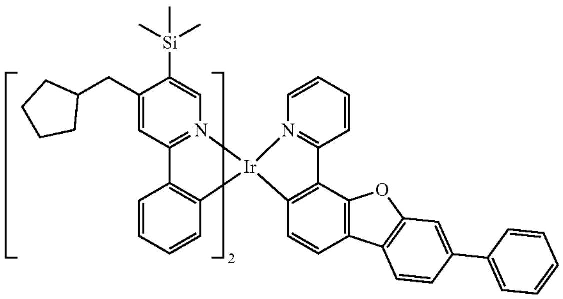
102
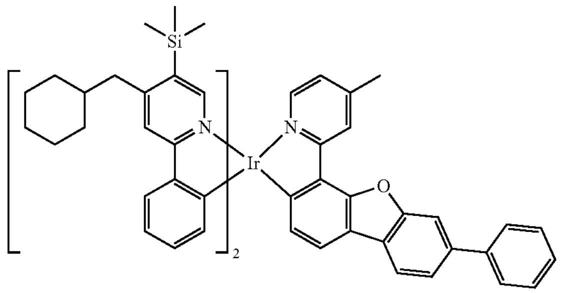
103
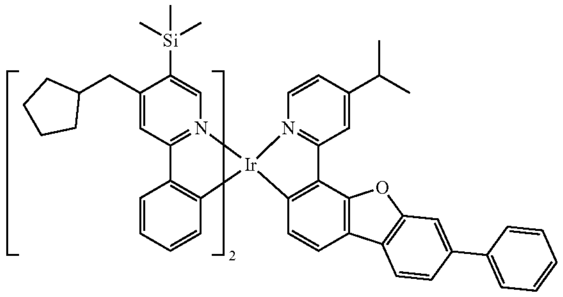
104
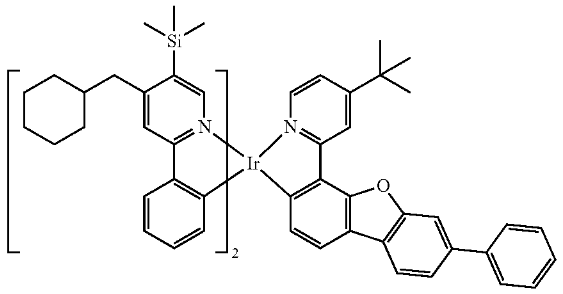
105
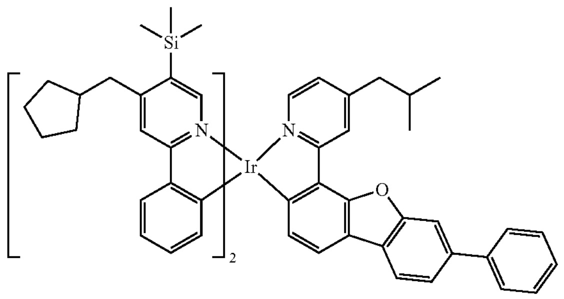
106
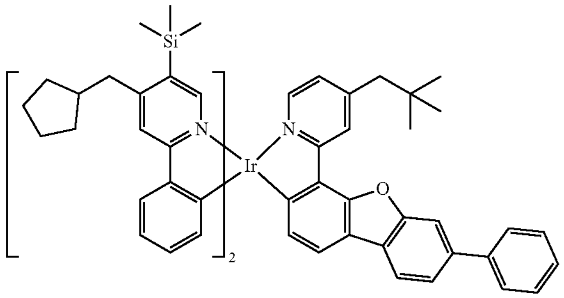
107
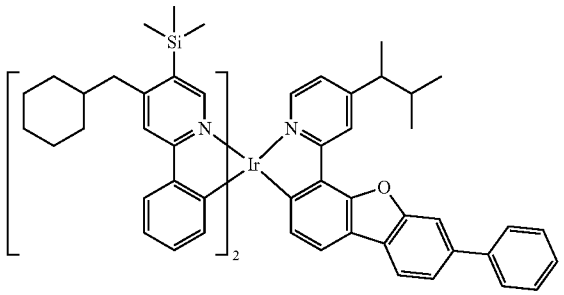
108
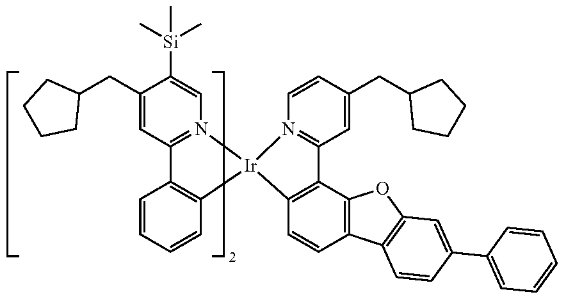
109
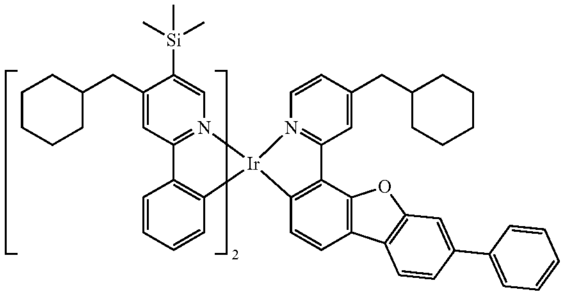

-continued
110
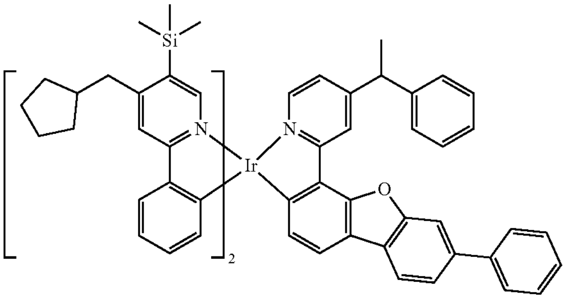
111
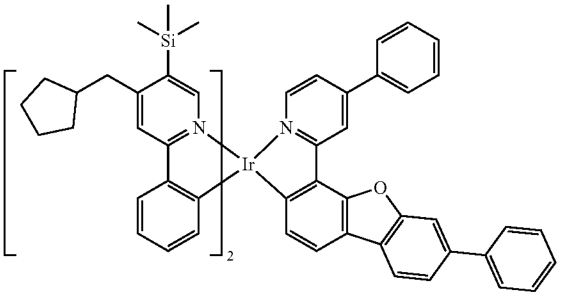
112
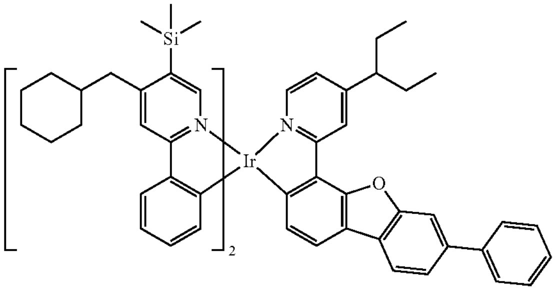
113
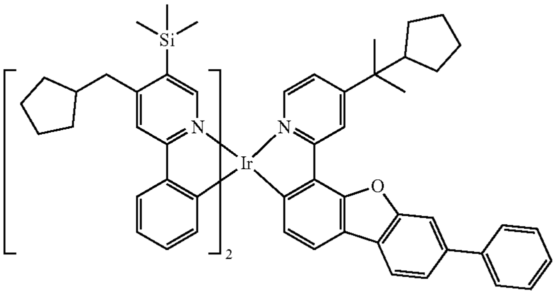
114
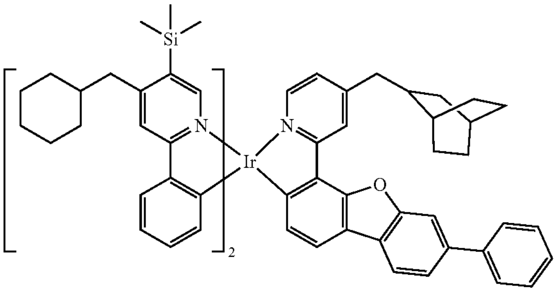
-continued
115
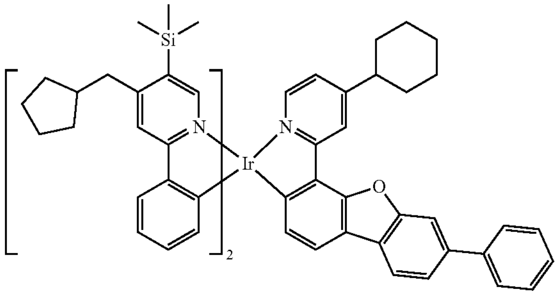
116
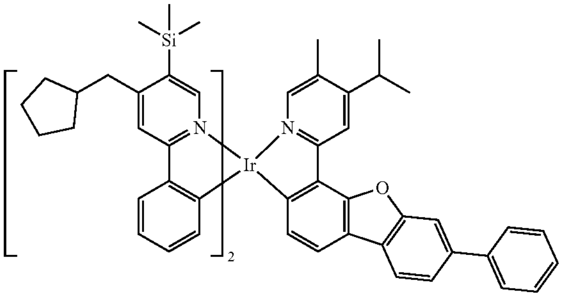
117
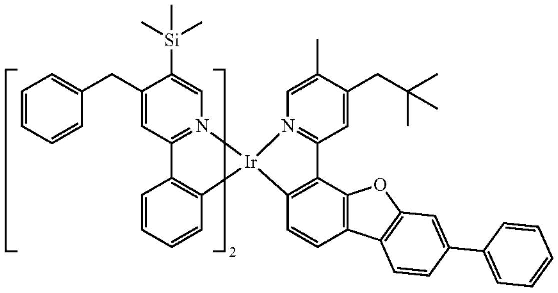
118
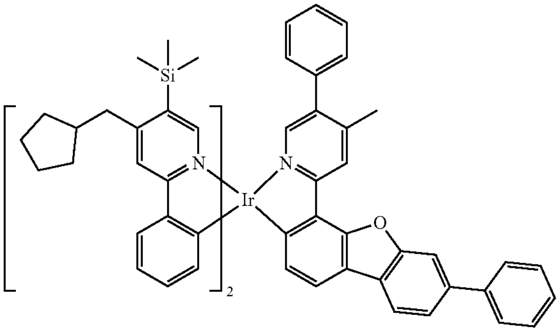
119
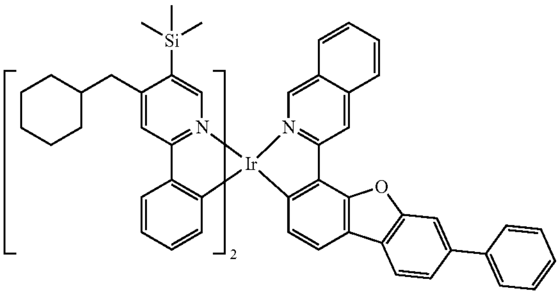

-continued
120
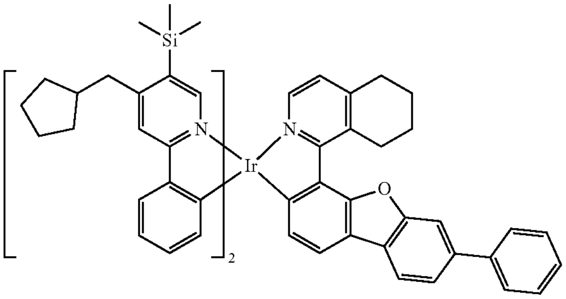
121
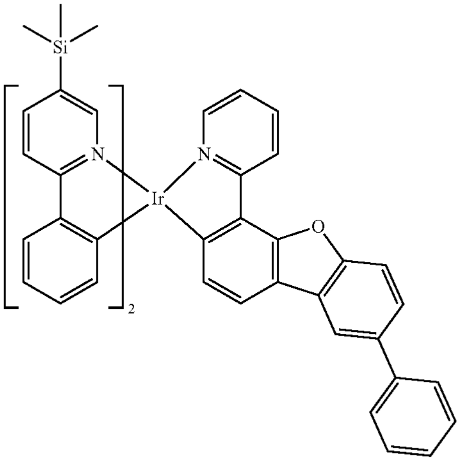
122
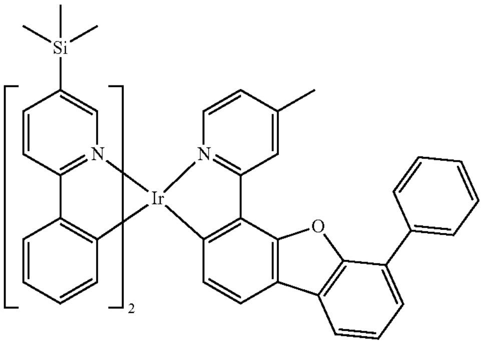
123
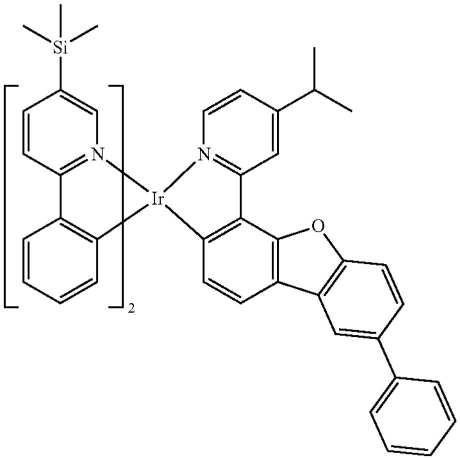
-continued
124
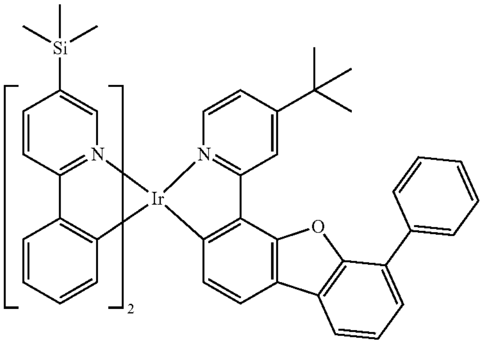
125
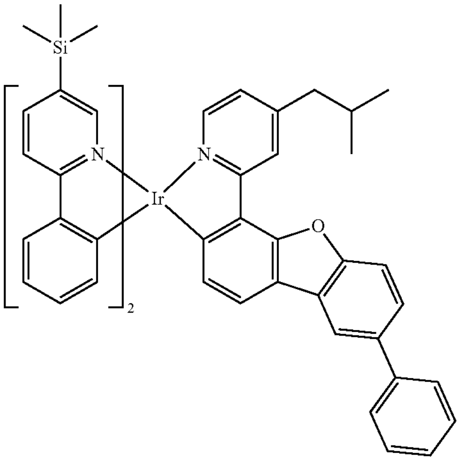
126
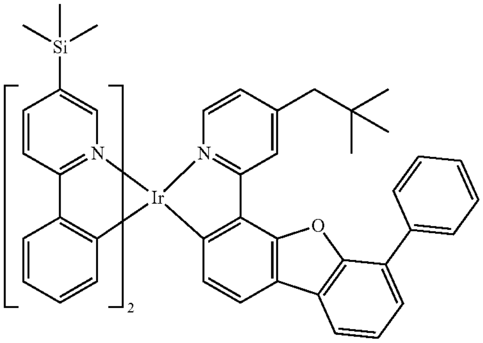
127
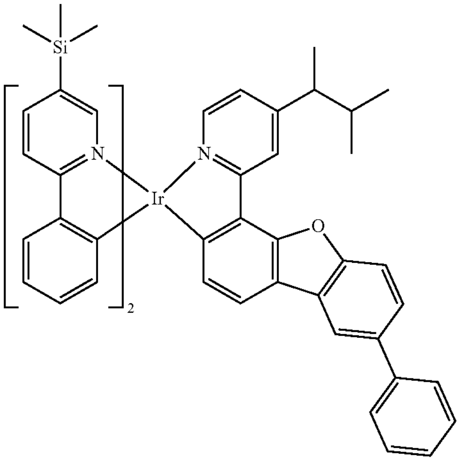

-continued
128
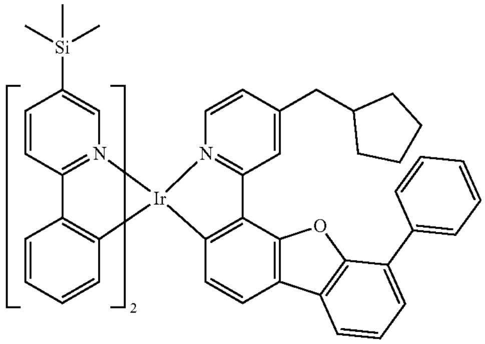
129
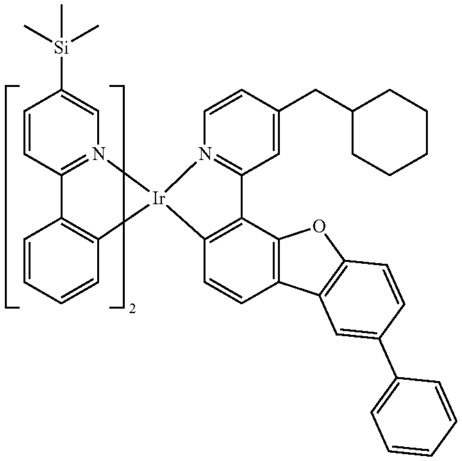
130
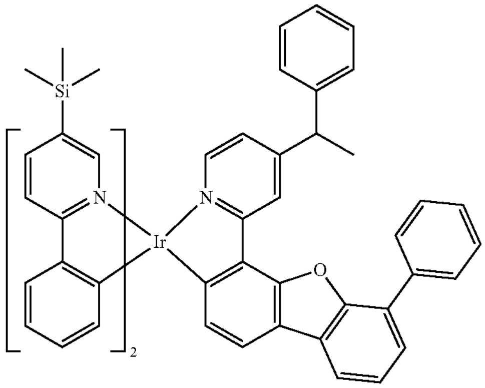
-continued
131
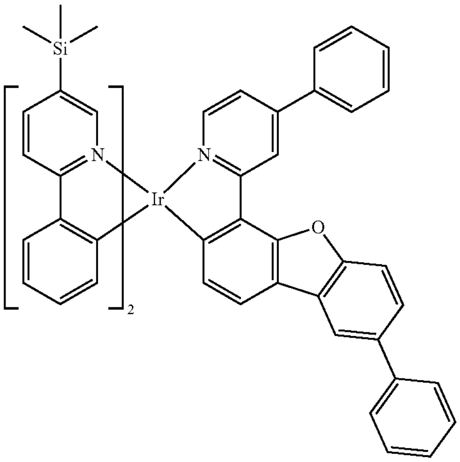
132
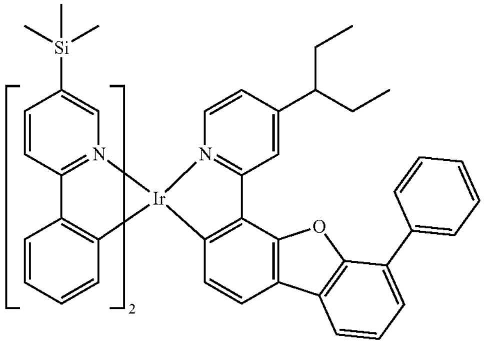
133
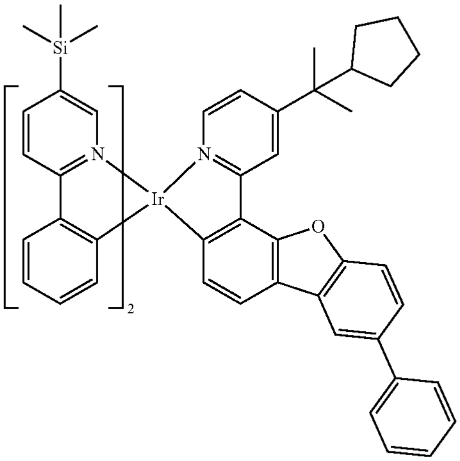

-continued
134
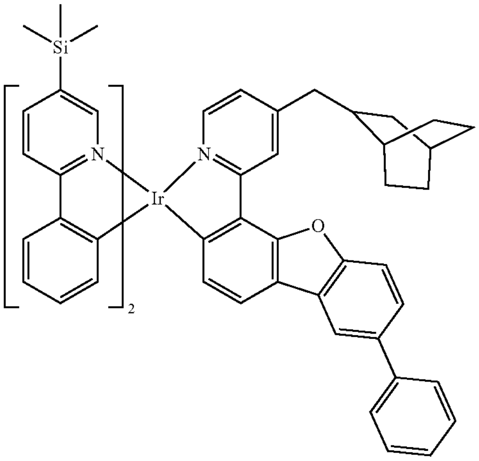
135
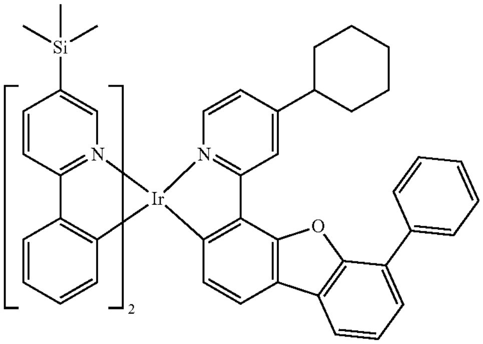
136
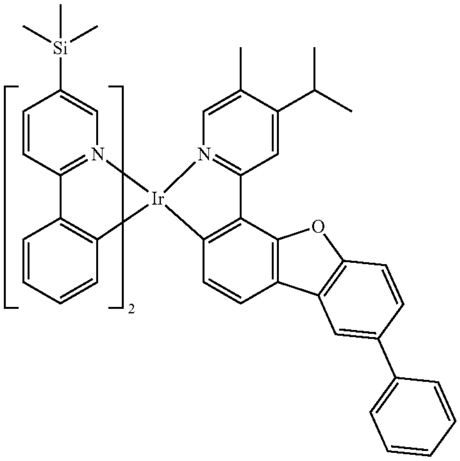
137
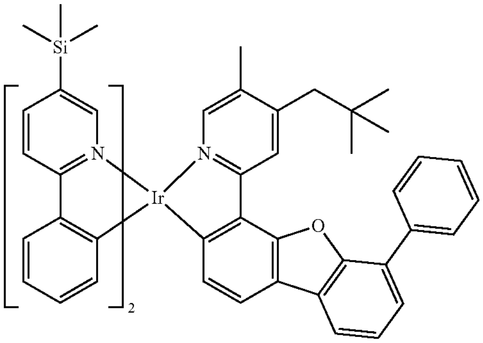
-continued
138
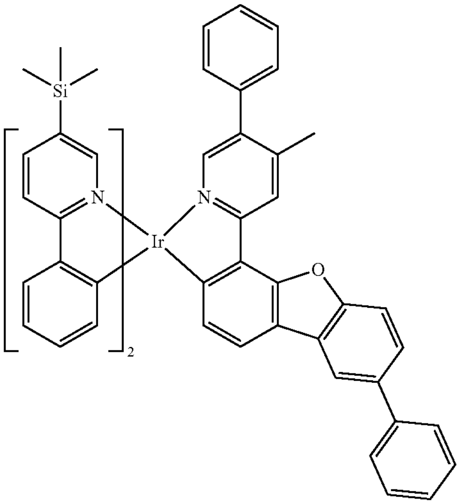
139
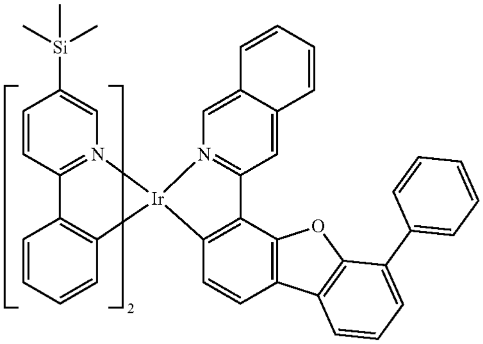
140
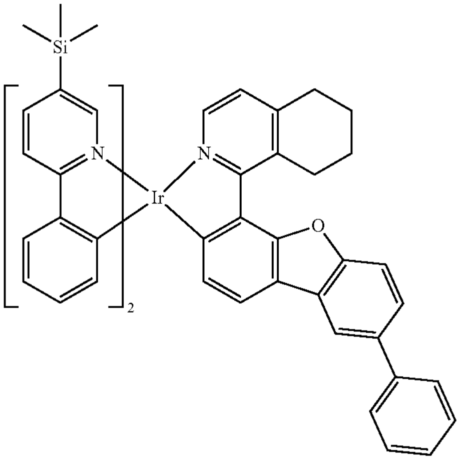

-continued
141
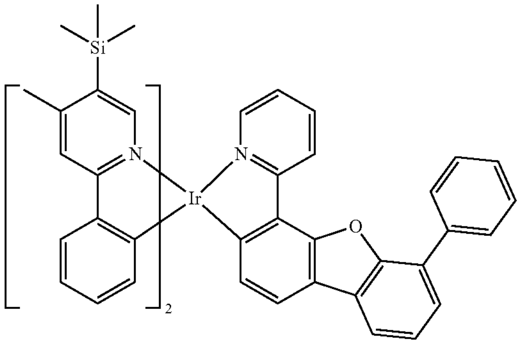
142
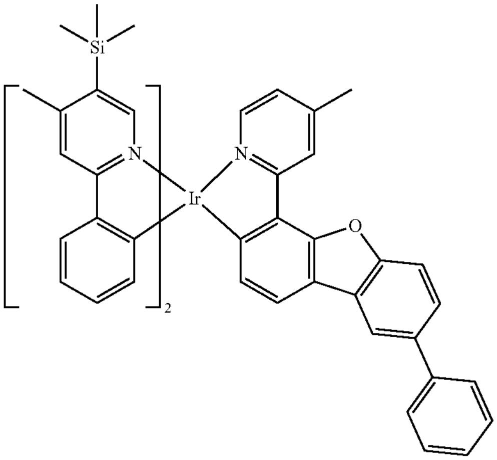
143
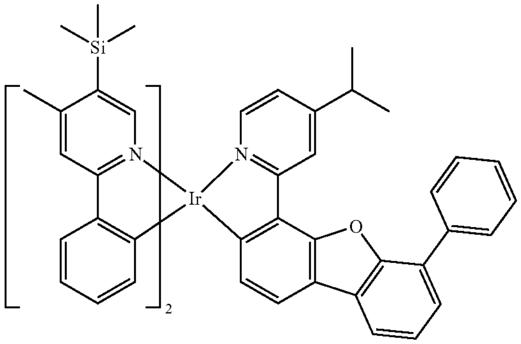
144
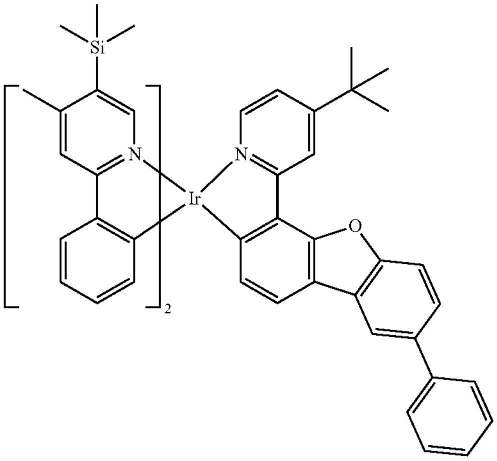
-continued
145
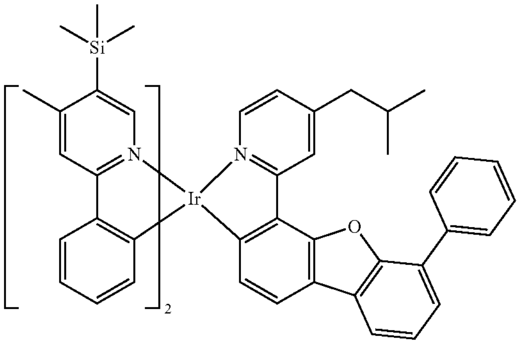
146
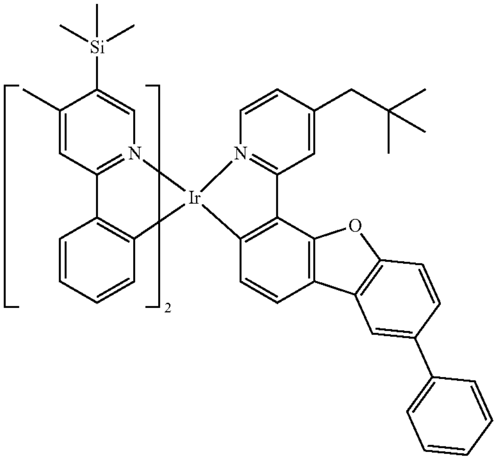
147
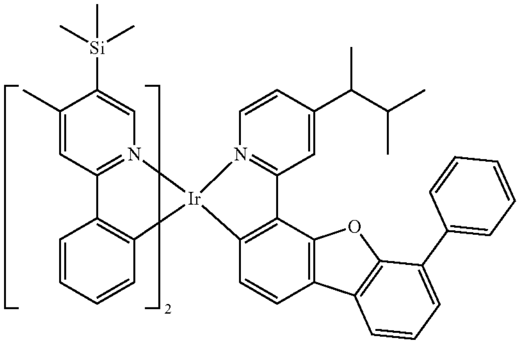
148
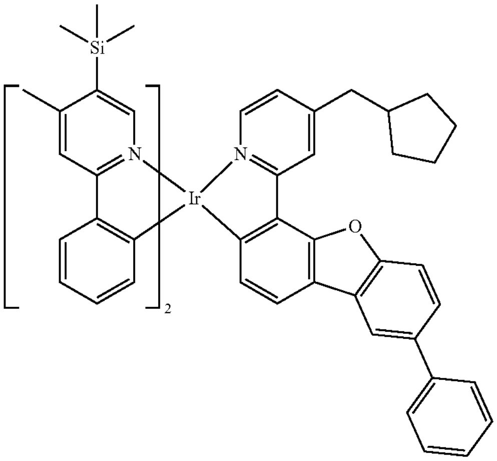

-continued
148
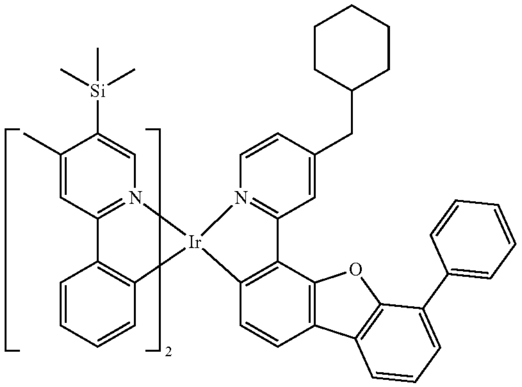
150
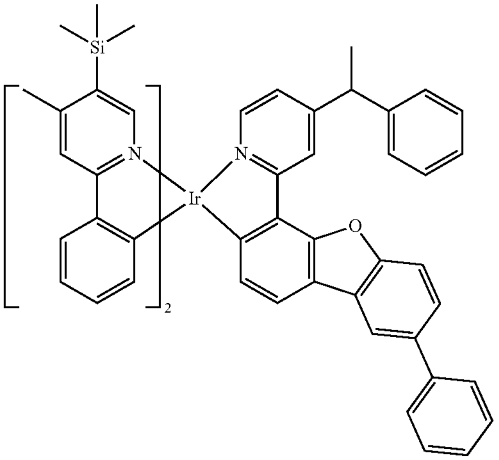
151
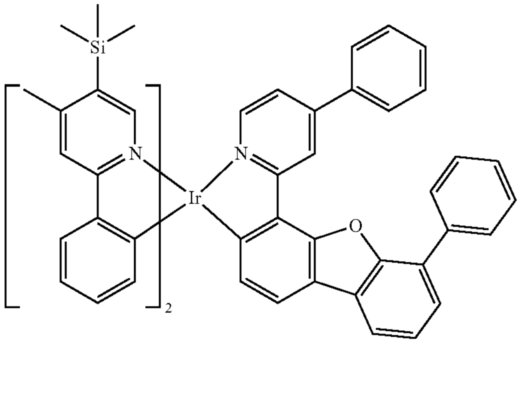
-continued
152
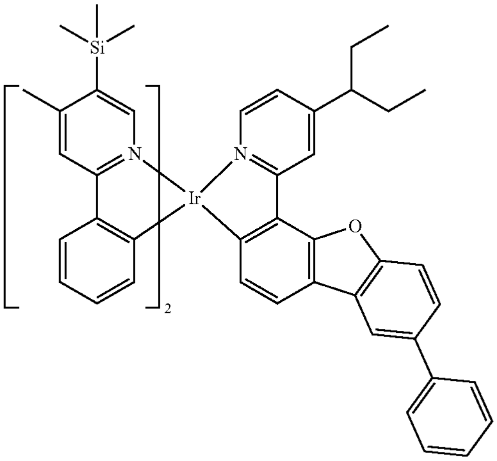
153
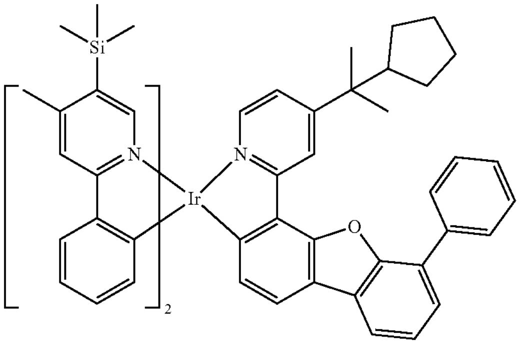
154
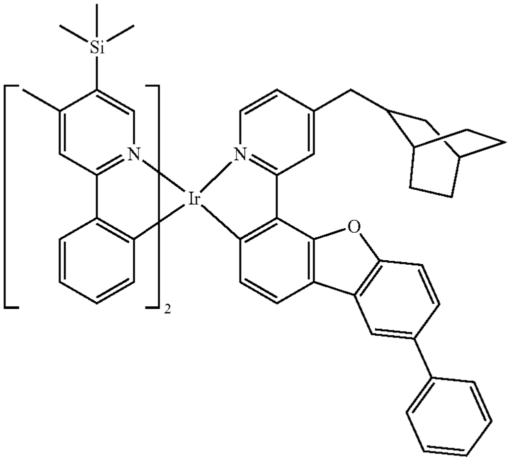
155
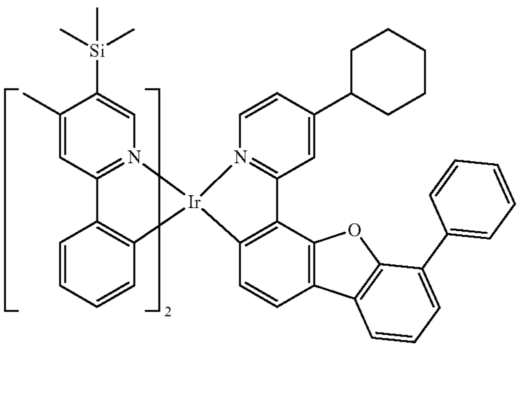

-continued
156
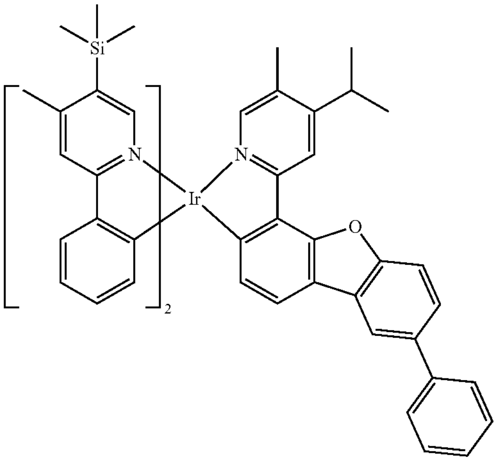
157
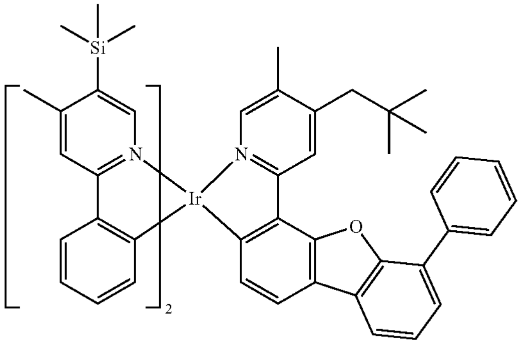
158
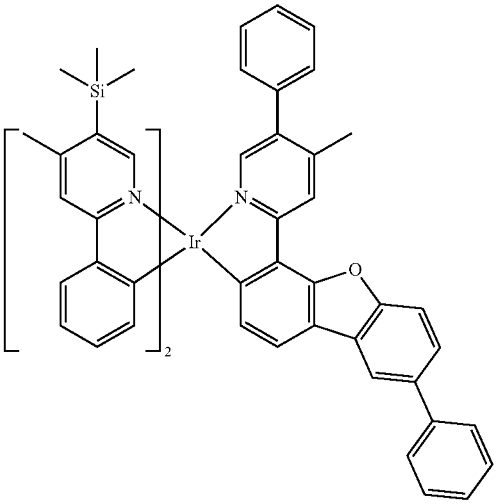
-continued
159
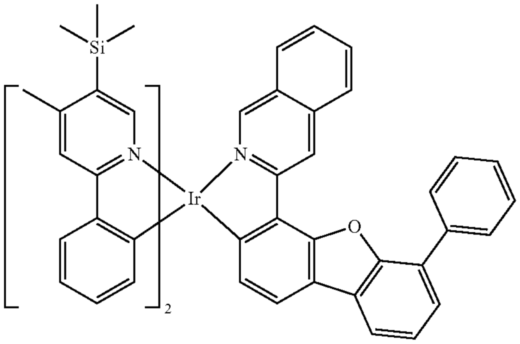
160
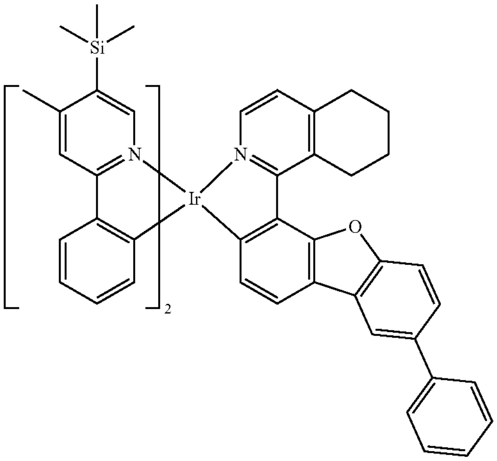
161
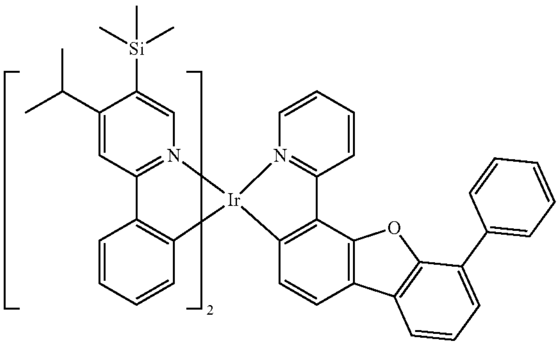

-continued
162
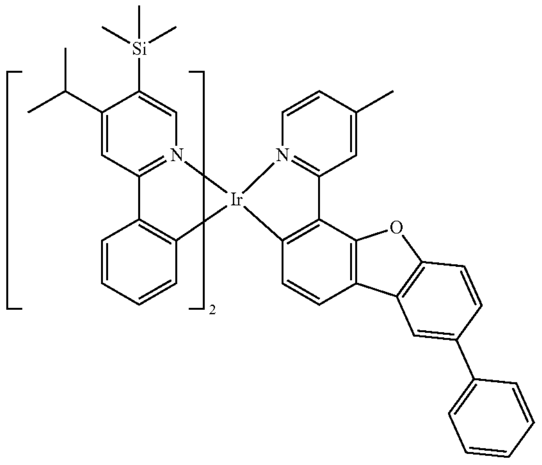
163
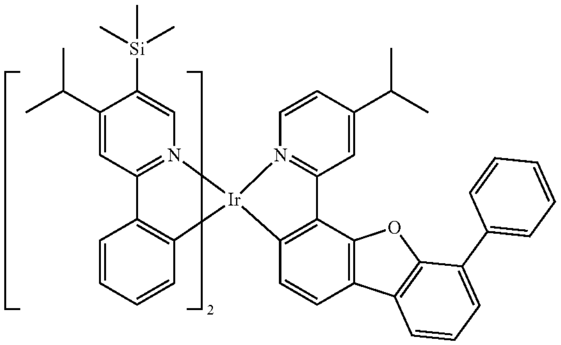
164
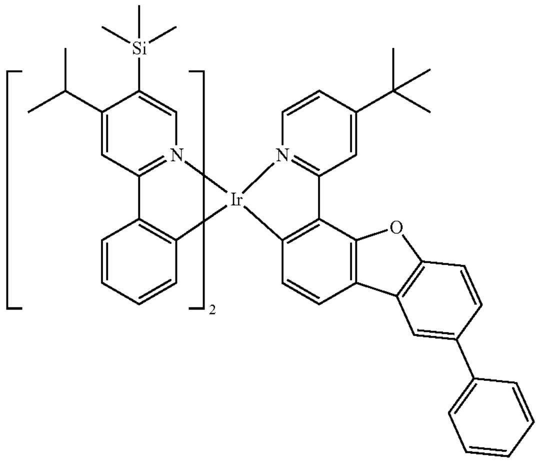
-continued
165
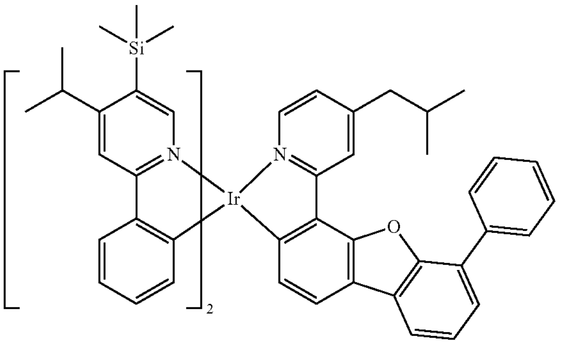
166
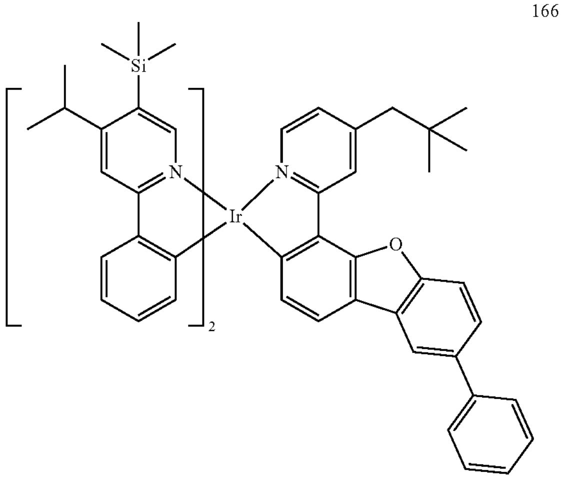
167
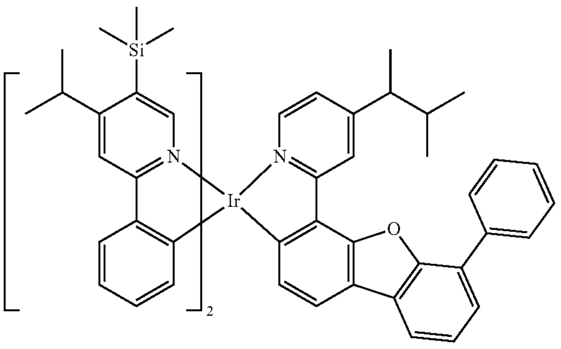

-continued
168
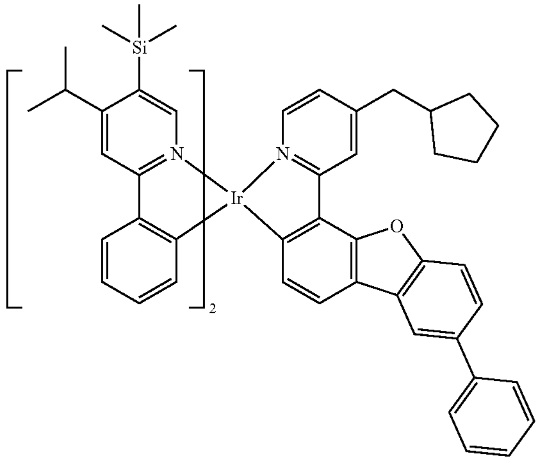
169
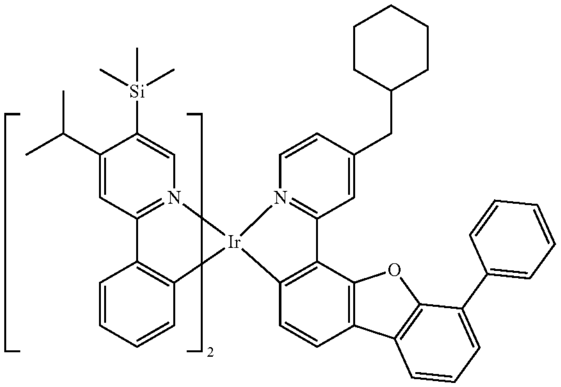
170
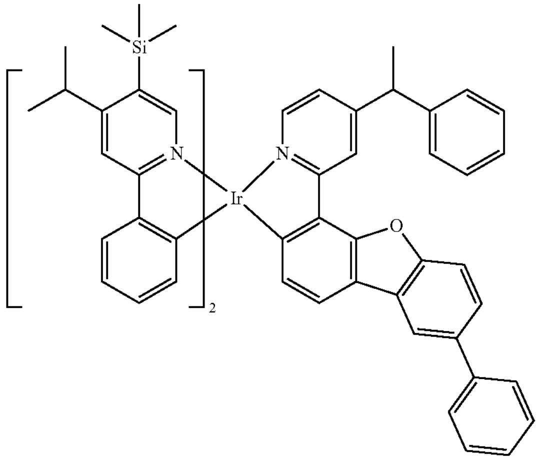
-continued
171
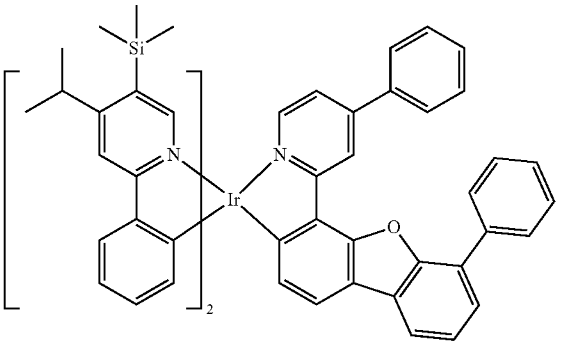
172
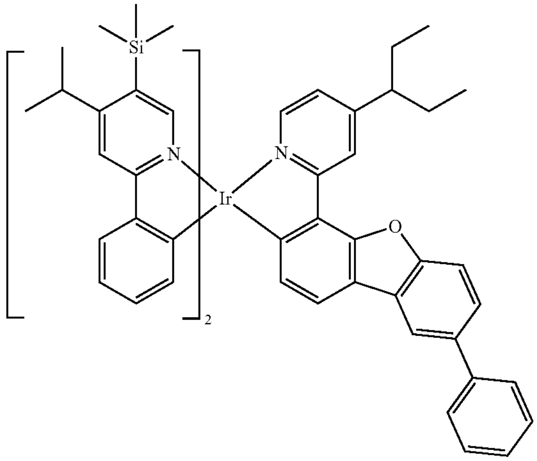
173
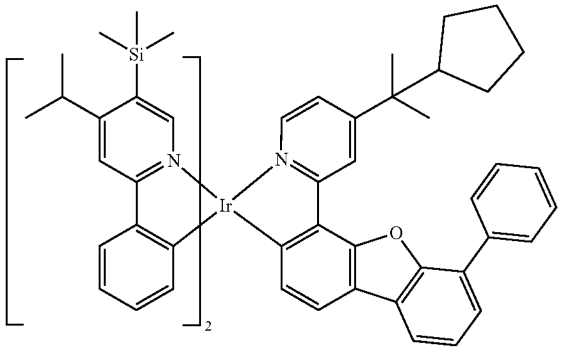

-continued
174
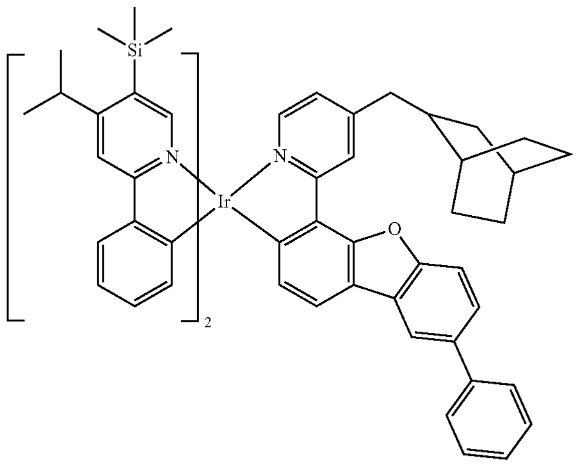
175
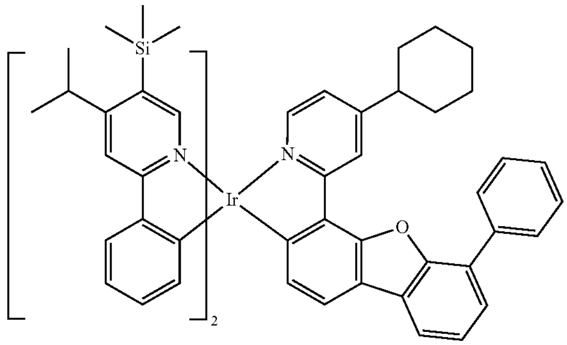
176
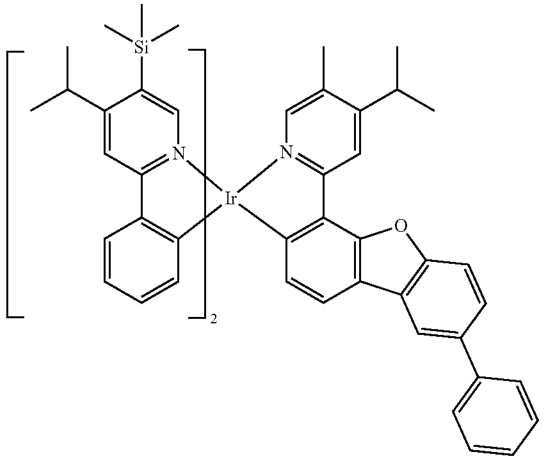
-continued
177
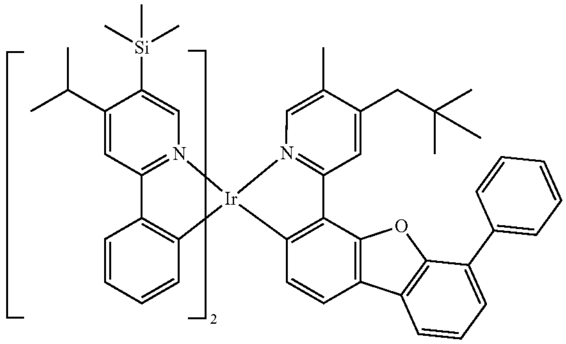
178
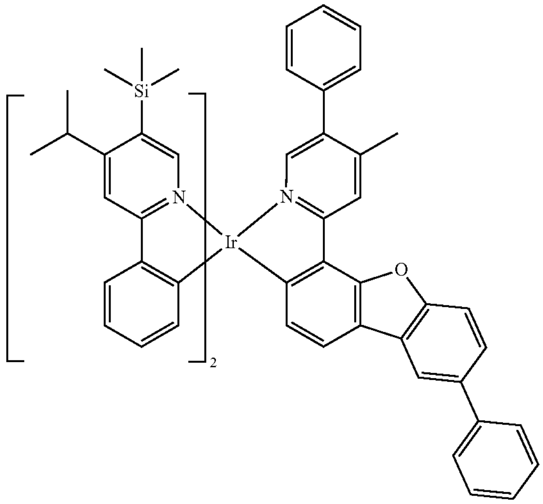
179
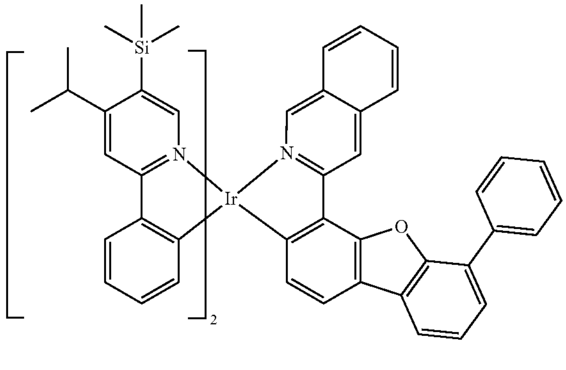

-continued
180
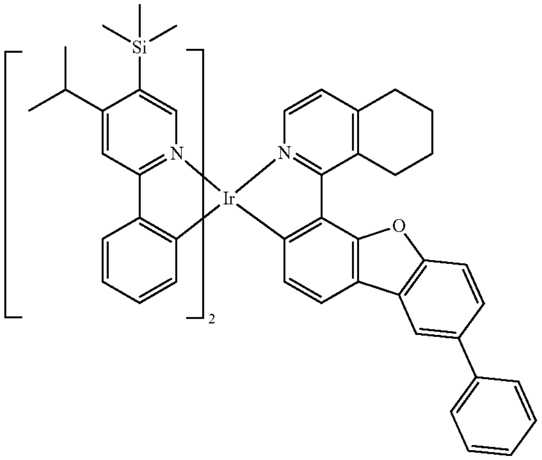
181
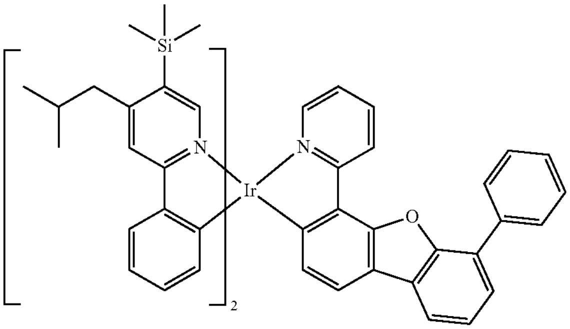
182
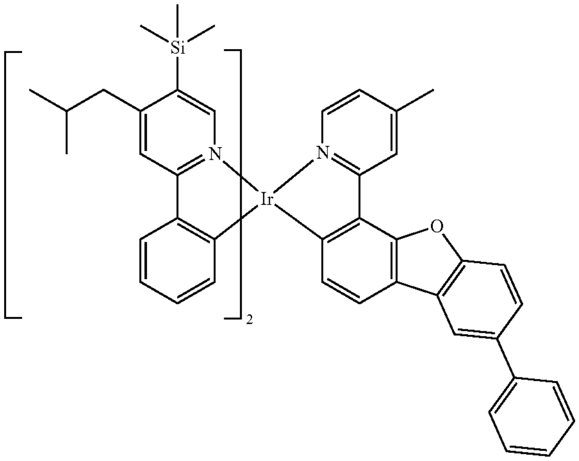
-continued
183
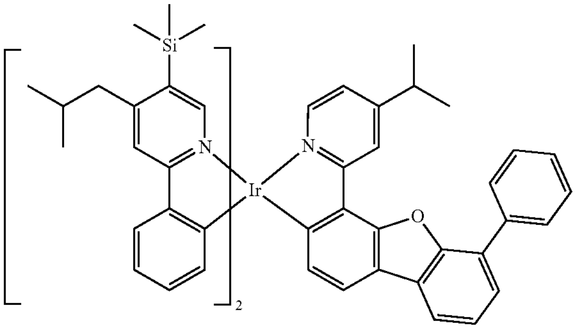
184
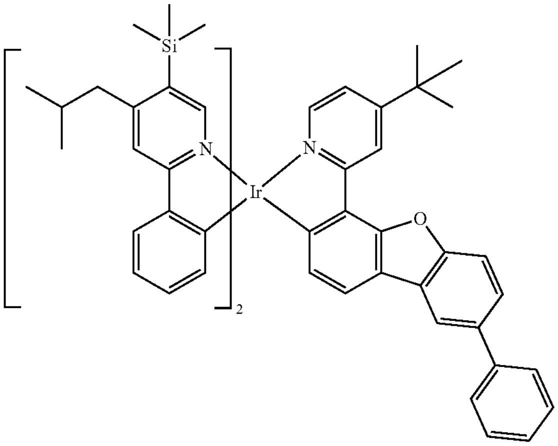
185
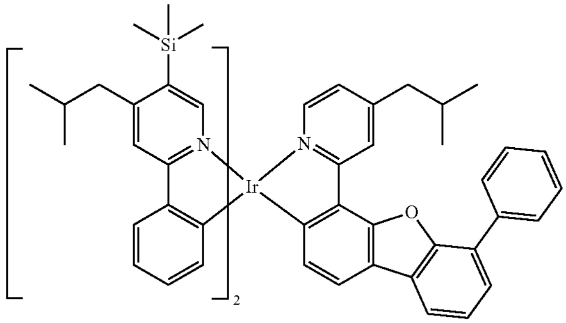
186
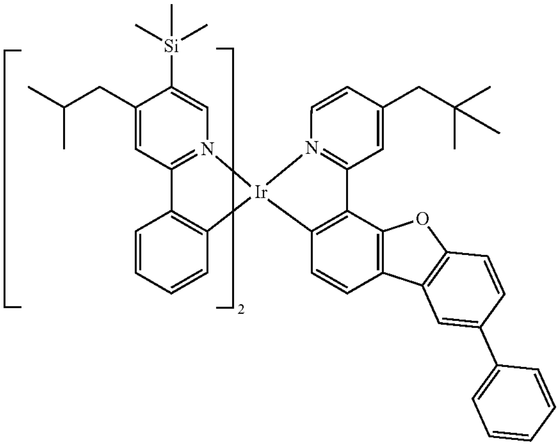

-continued
187
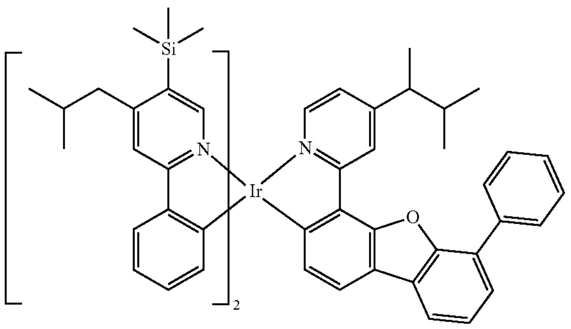
188
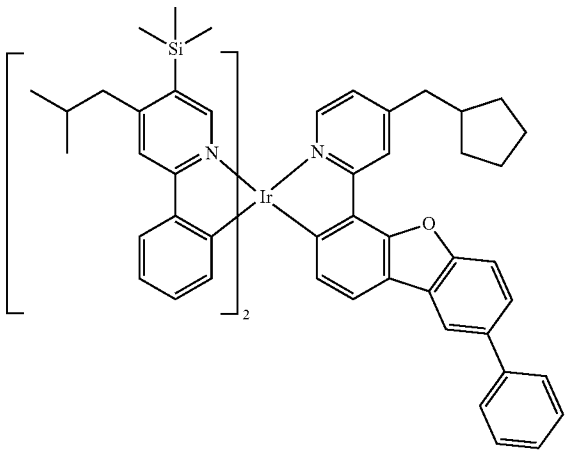
189
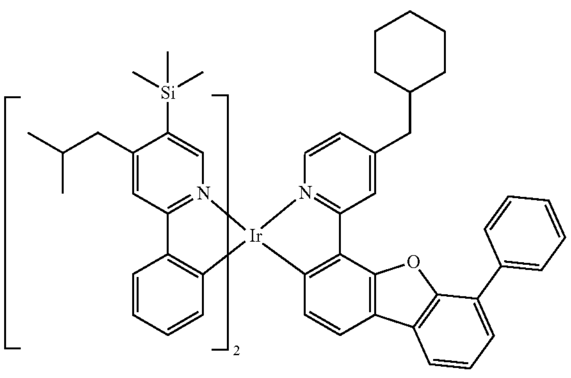
-continued
190
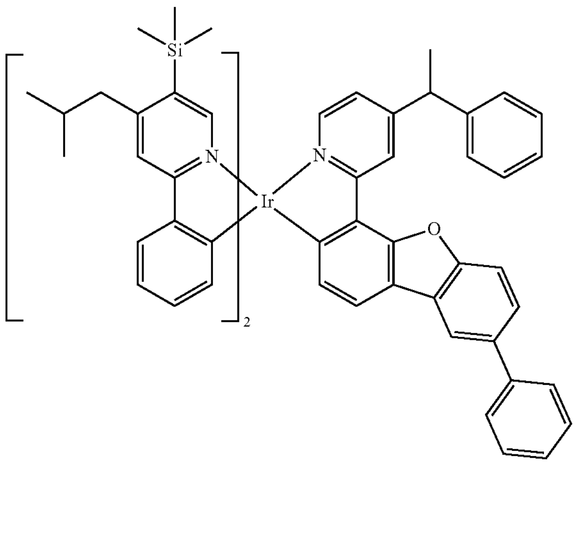
191
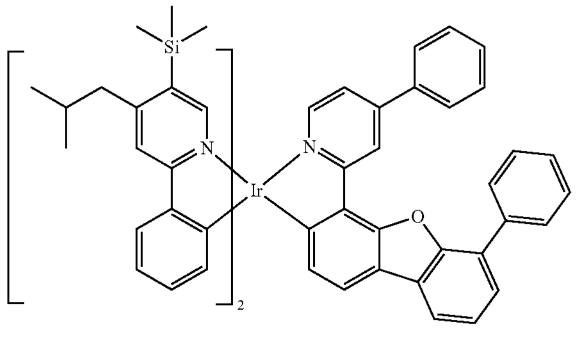
192
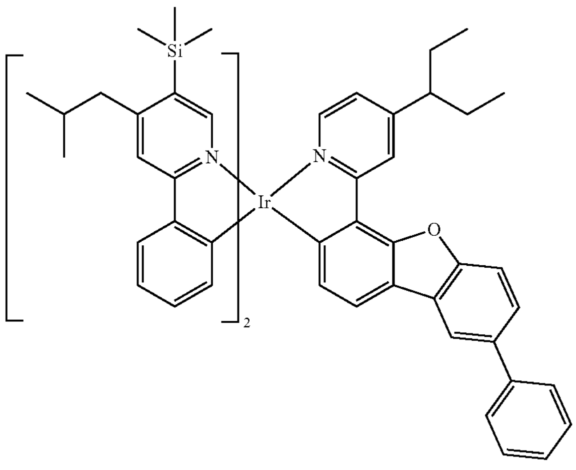

-continued
193
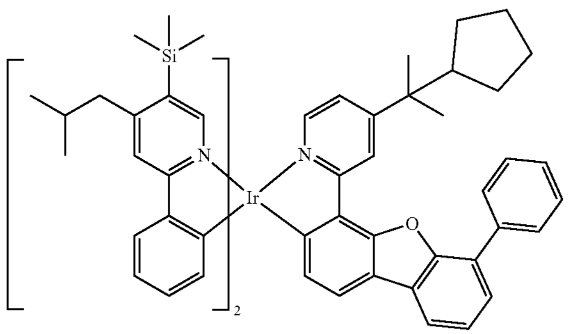
194
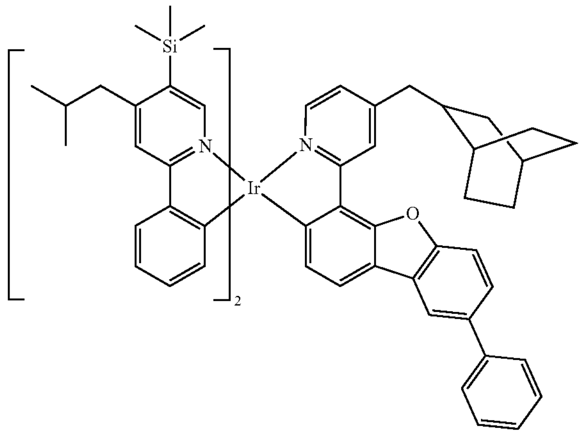
195
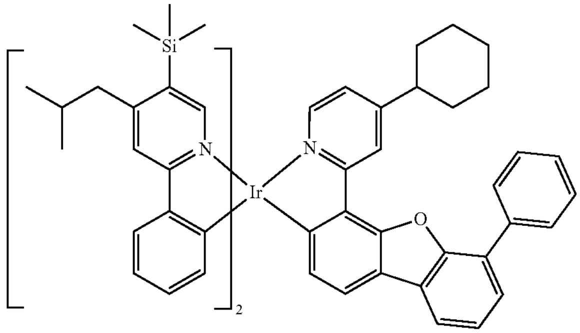
196
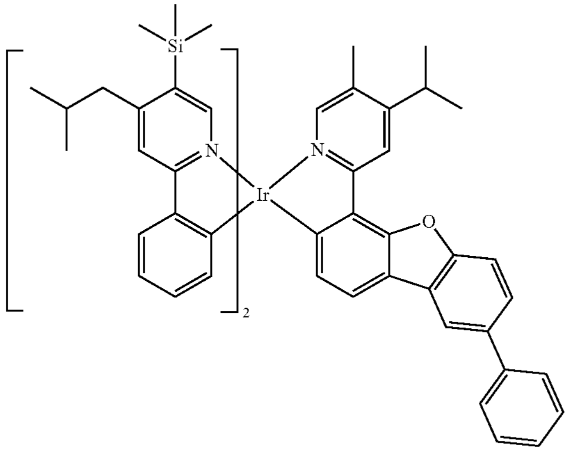
-continued
197
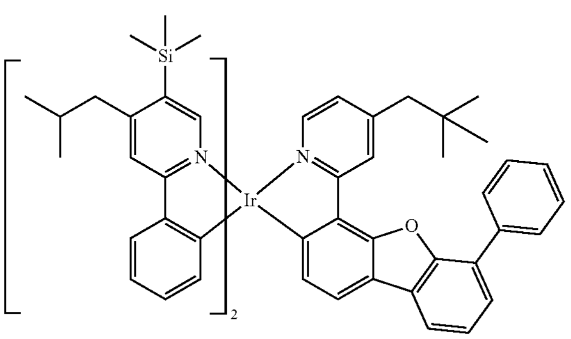
198
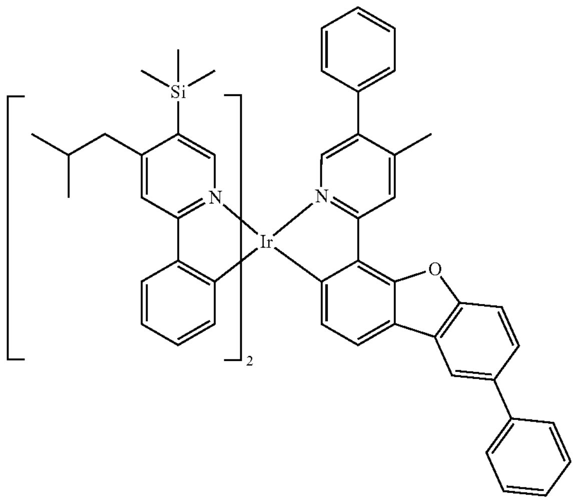
199
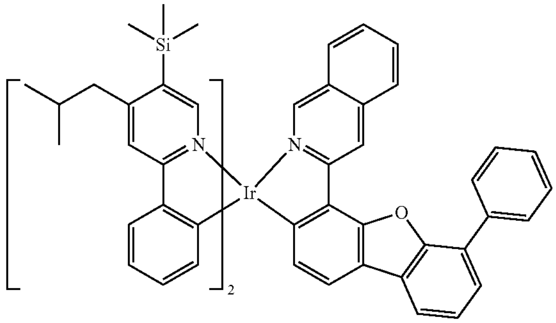

-continued
200
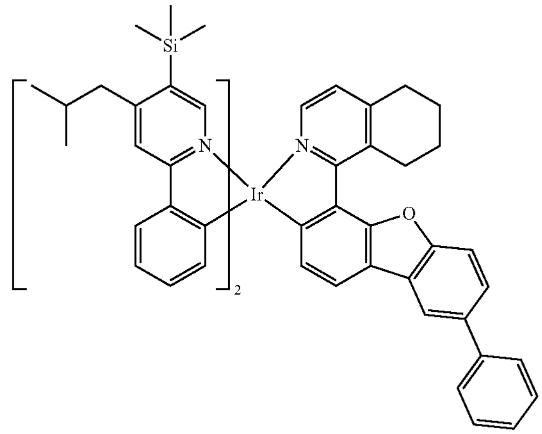
201
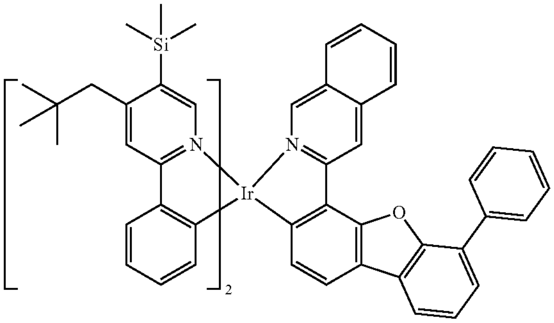
202
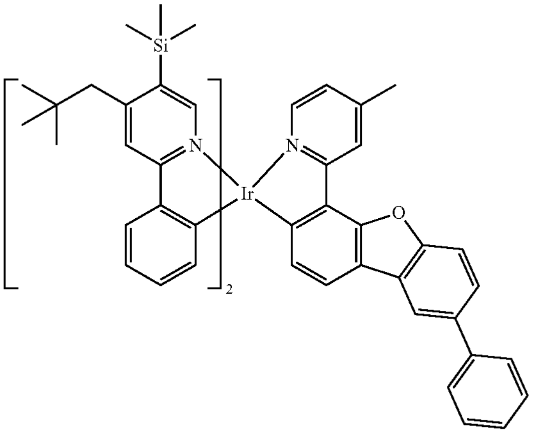
203
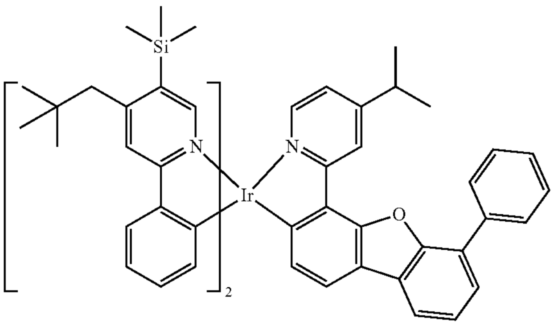
-continued
204
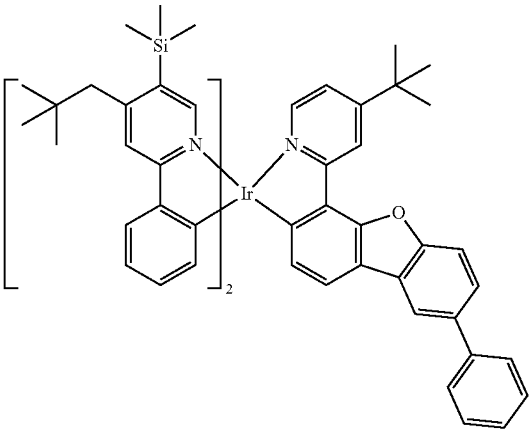
205
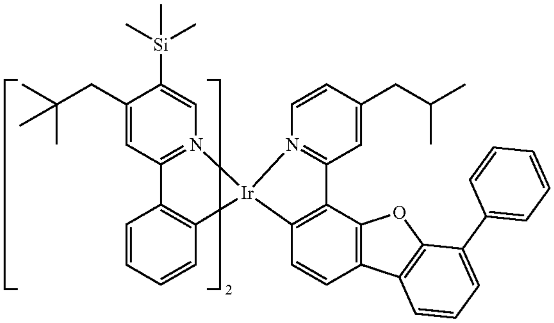
206
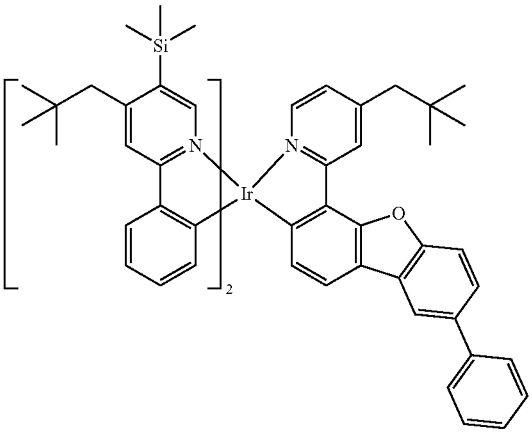
207
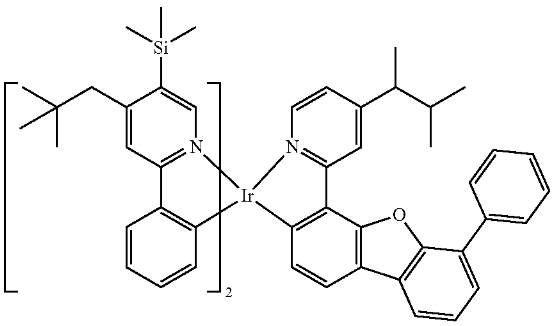

-continued
208
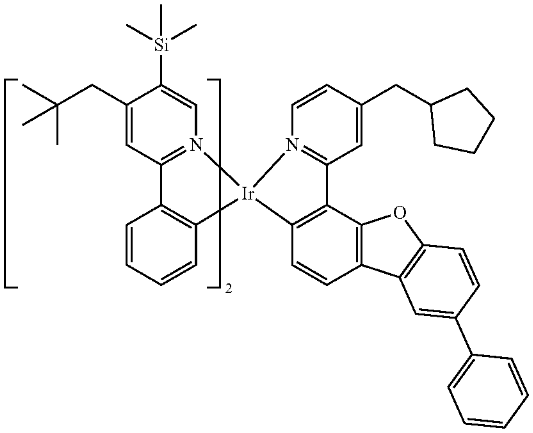
209
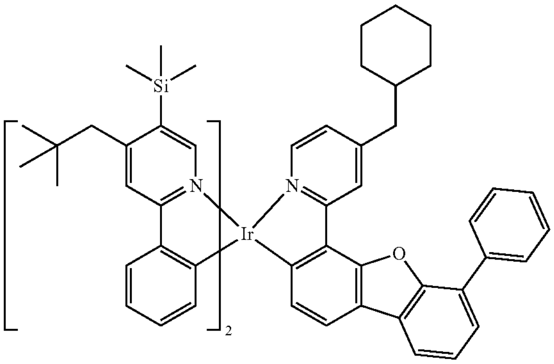
210
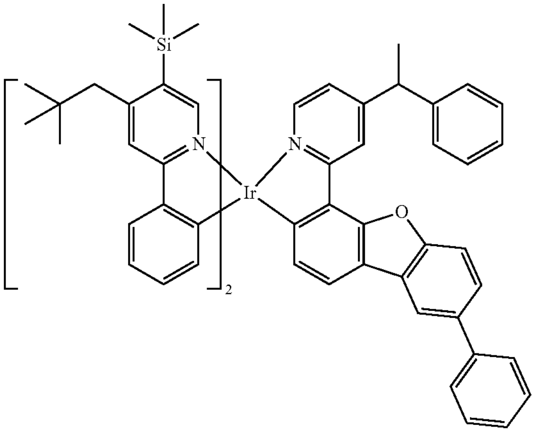
211
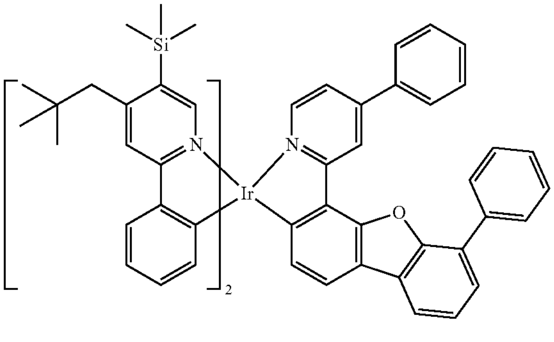
-continued
212
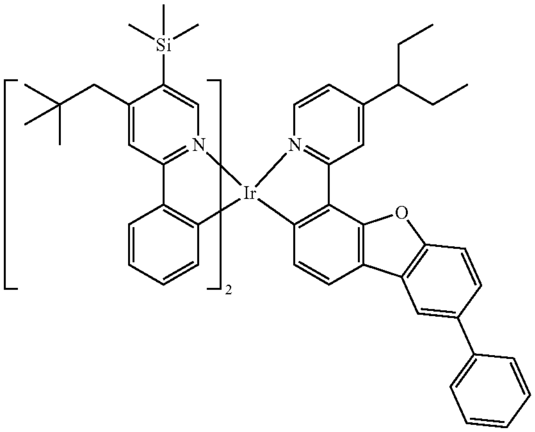
213
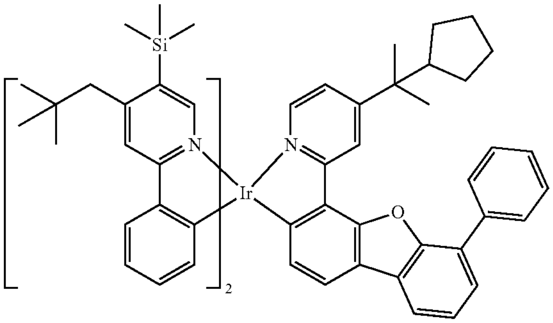
214
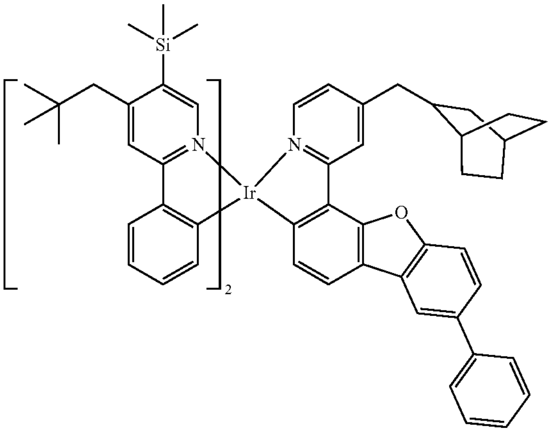
215
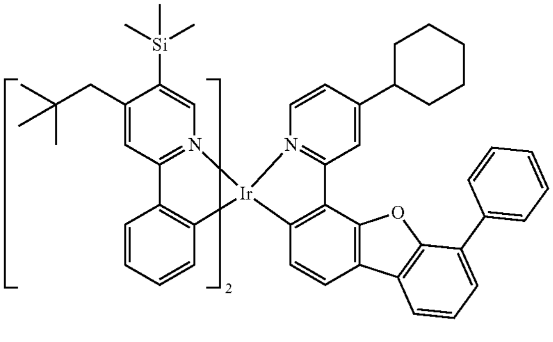

216
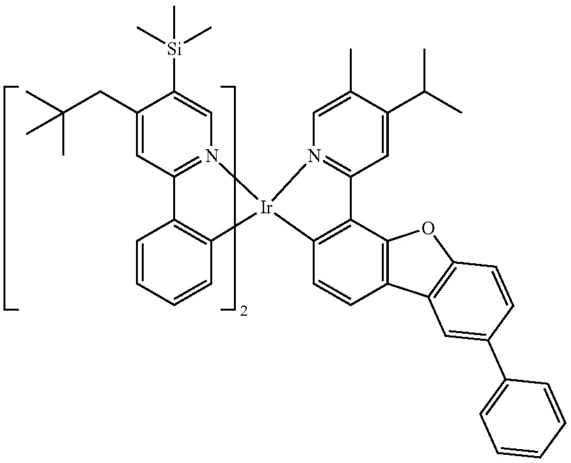
217
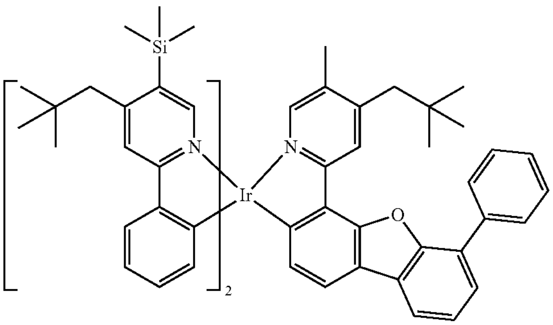
218
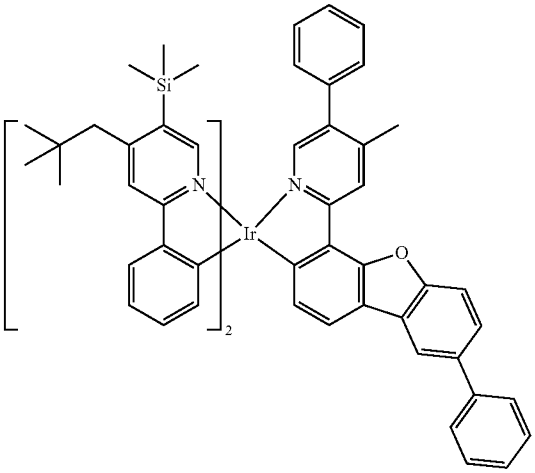
219
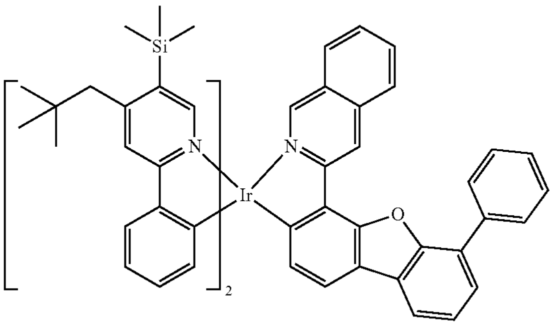
220
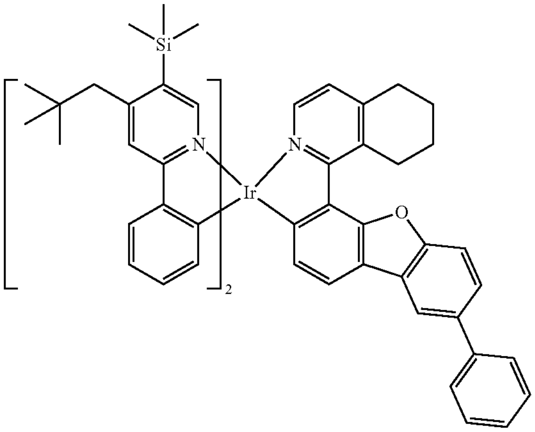
221
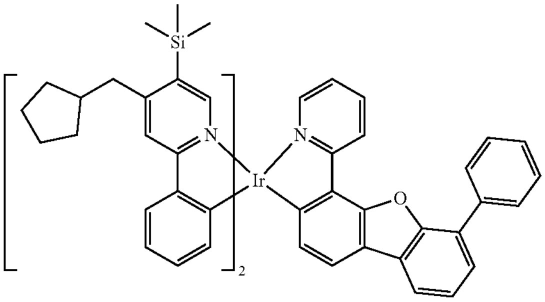
222
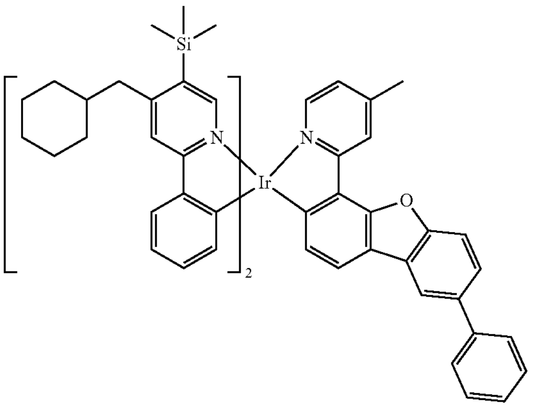

-continued
223
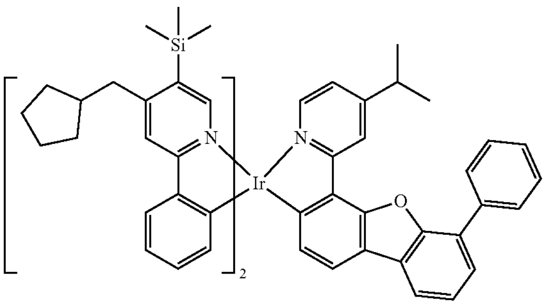
224
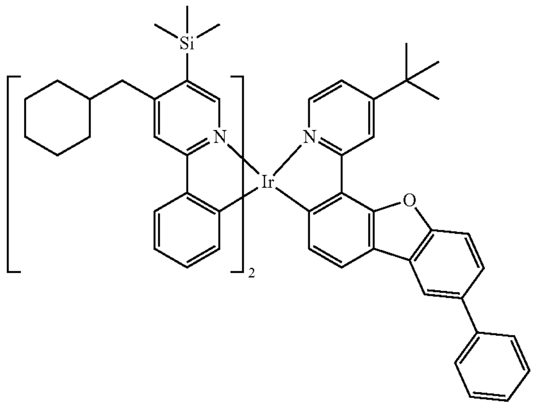
225
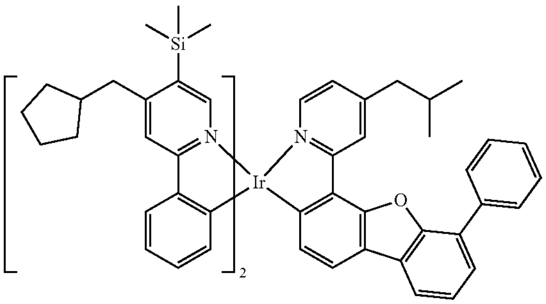
226
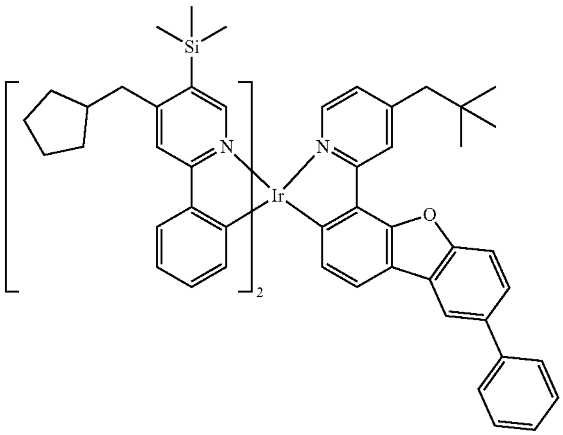
-continued
227
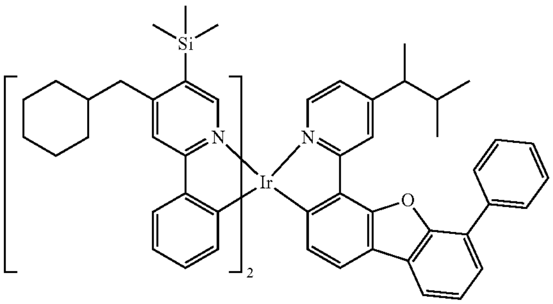
228
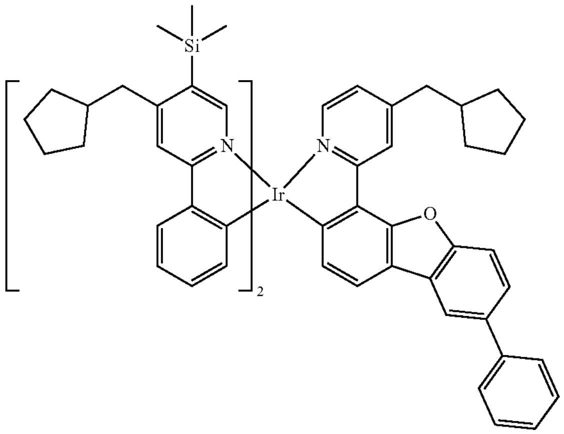
229
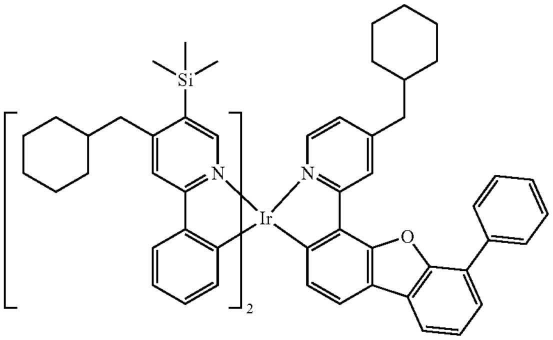
230
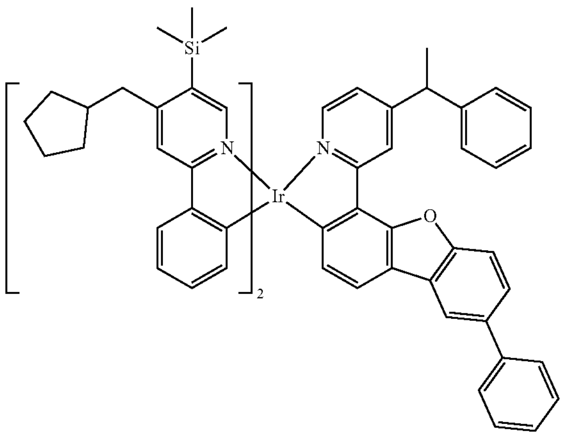

-continued
231
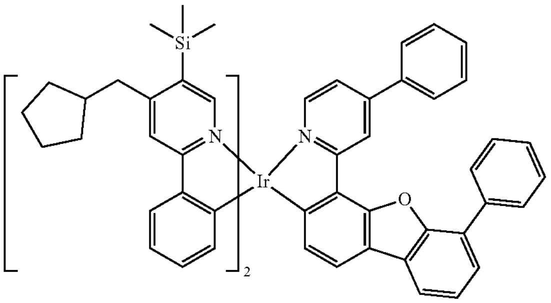
232
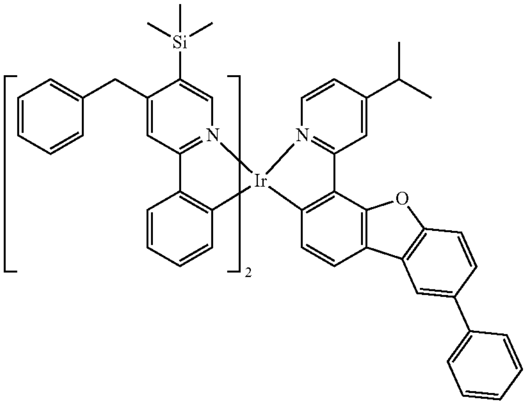
233
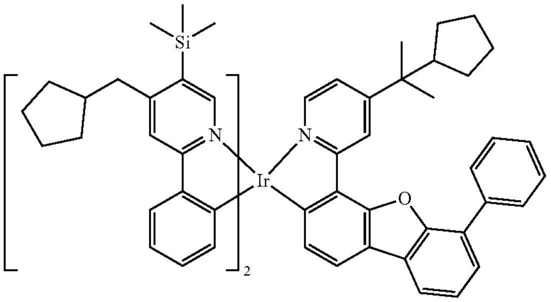
234
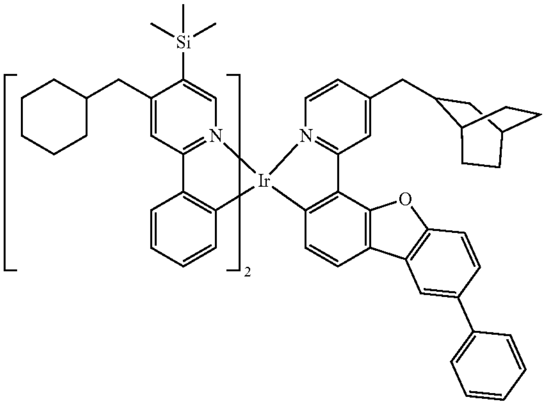
-continued
235
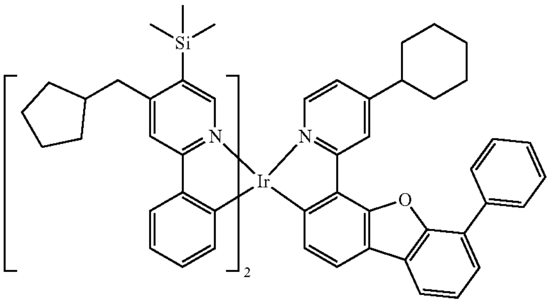
236
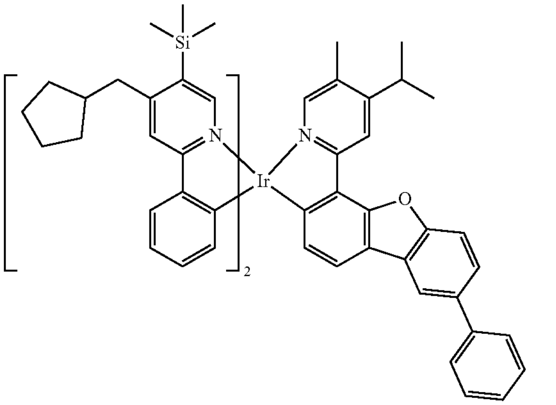
237
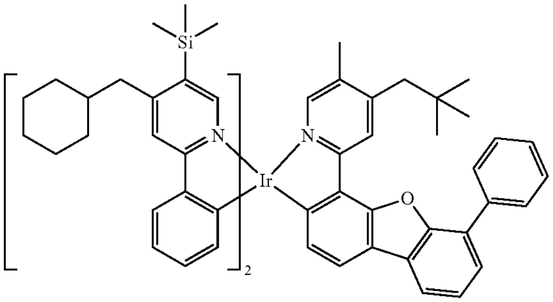
238
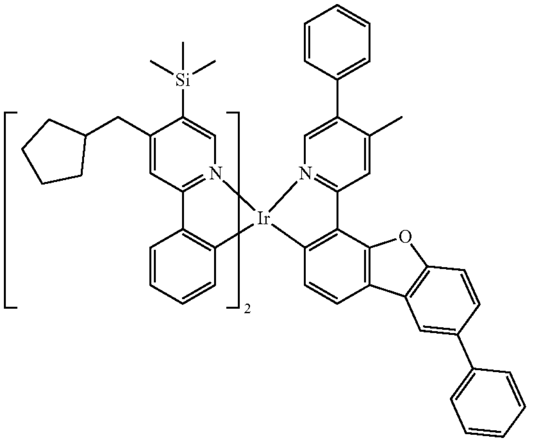

-continued
239
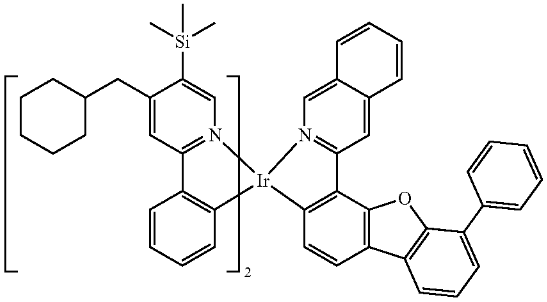
240
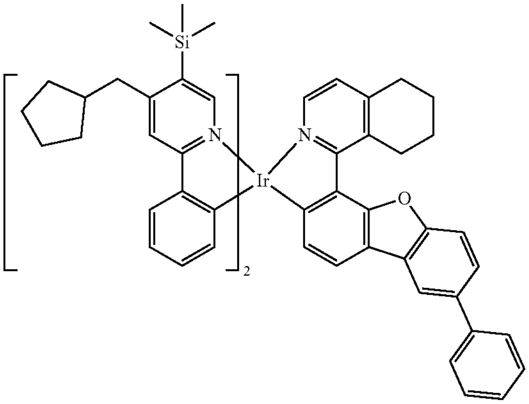
241
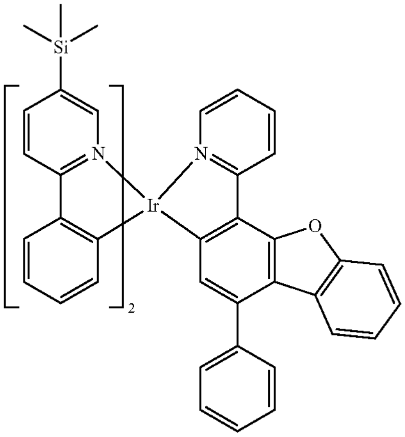
242
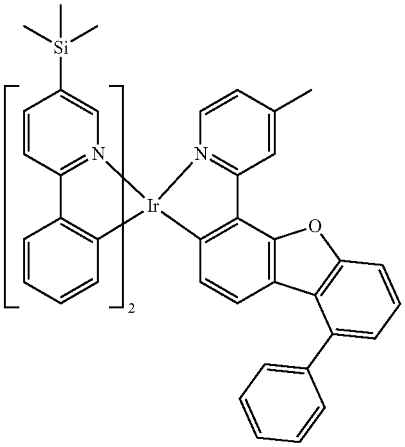
-continued
243
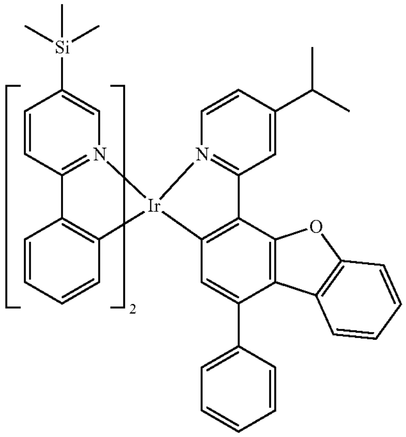
244
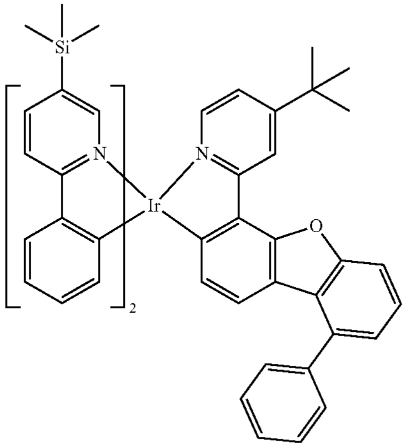
245
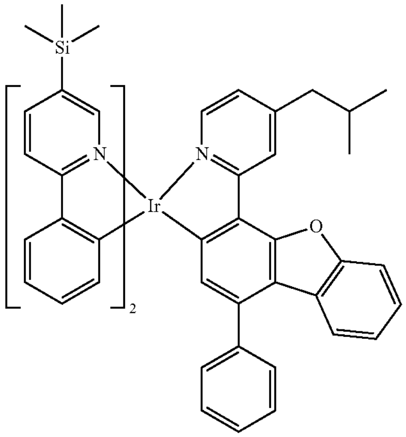

-continued
246
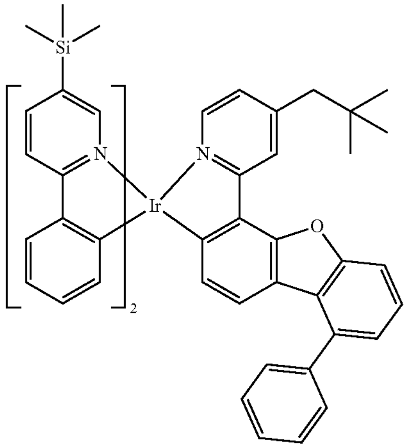
247
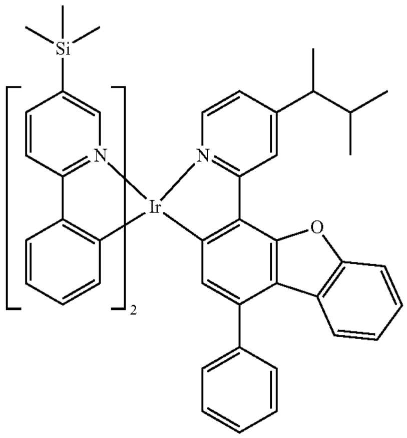
248
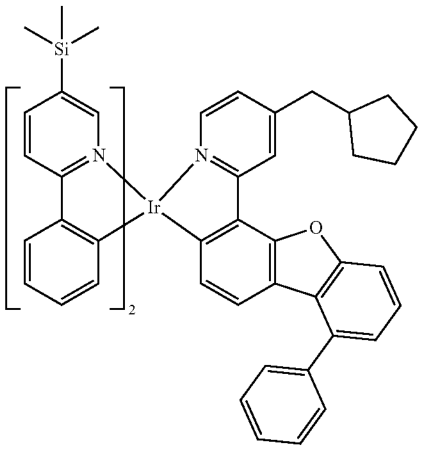
-continued
249
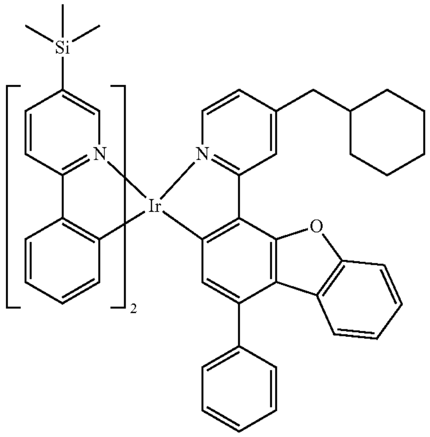
250
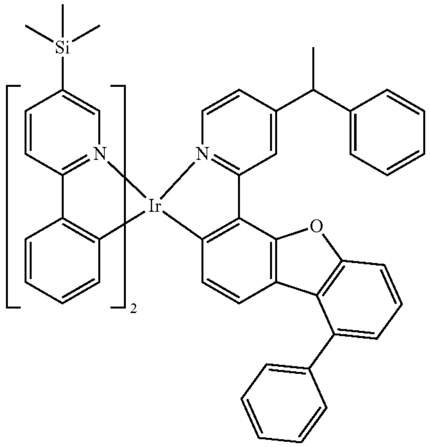
251
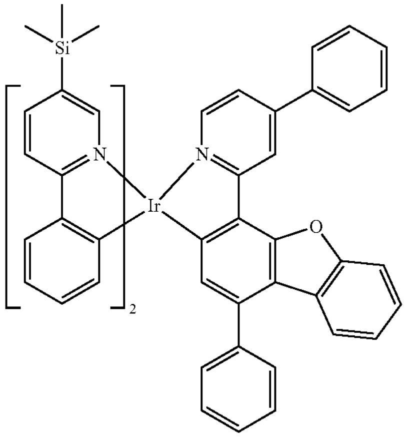

-continued
252
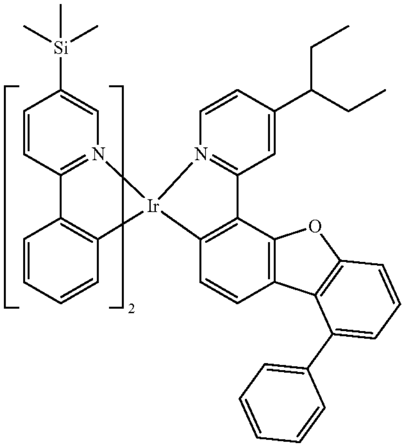
253
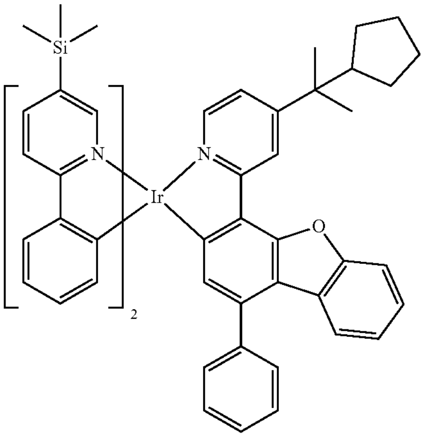
254
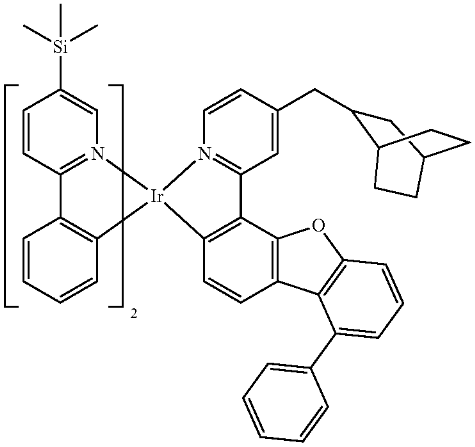
-continued
255
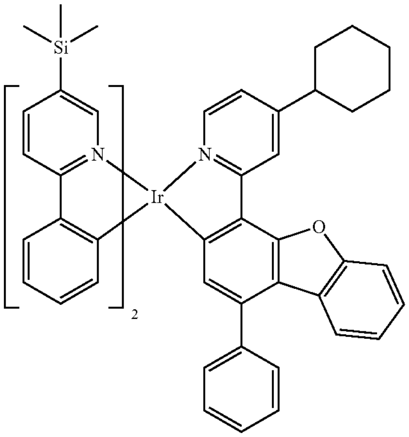
256
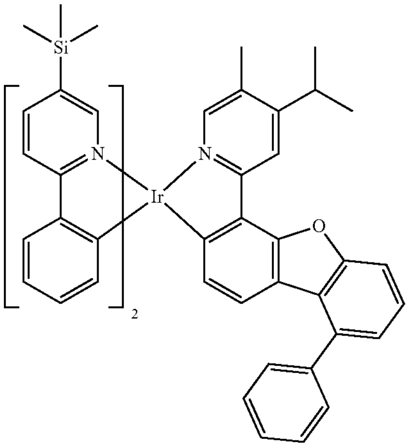
257
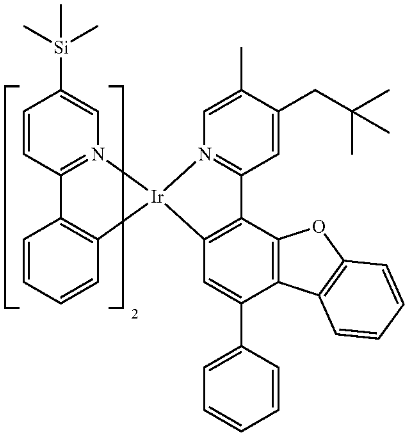

-continued
258
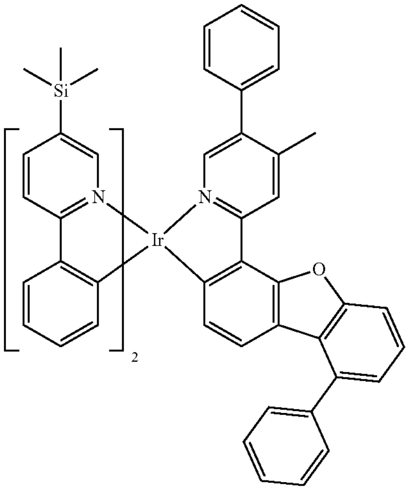
259
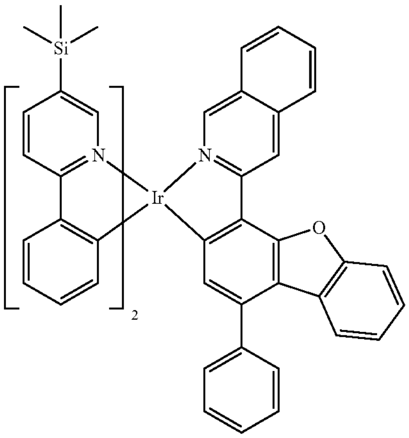
260
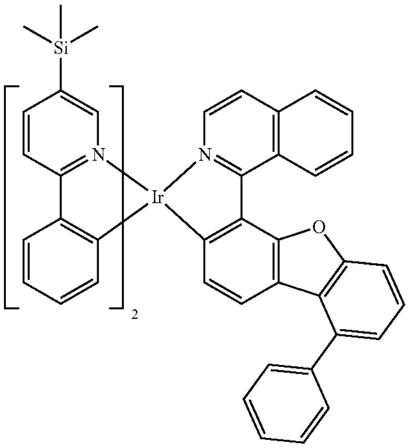
-continued
261
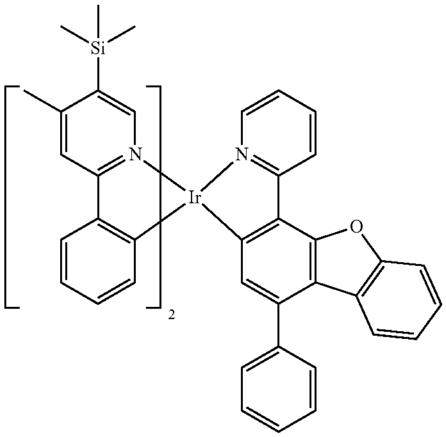
262
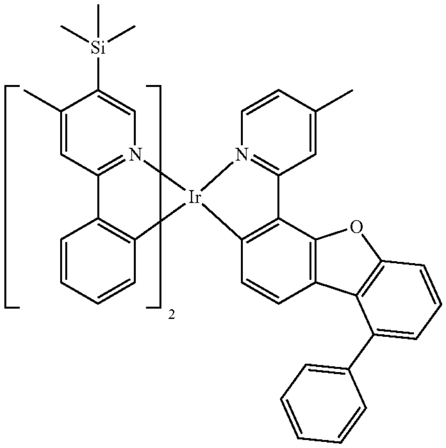
263
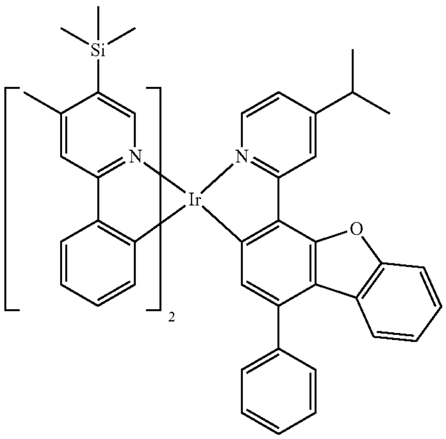

-continued
264
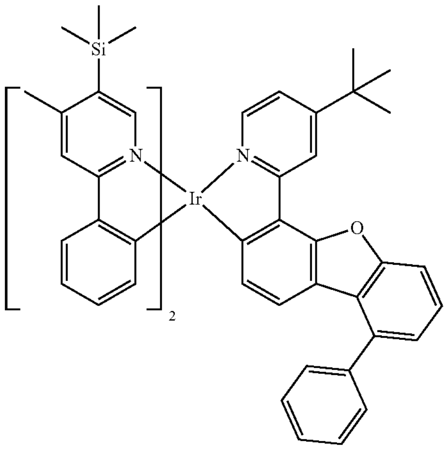
265
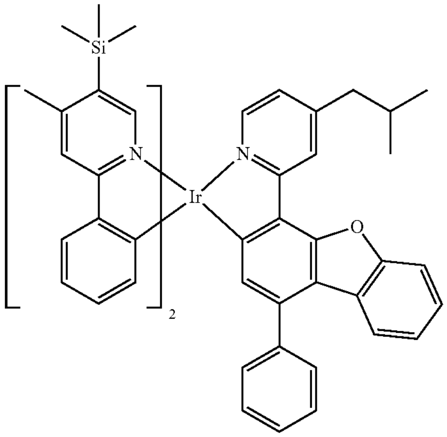
266
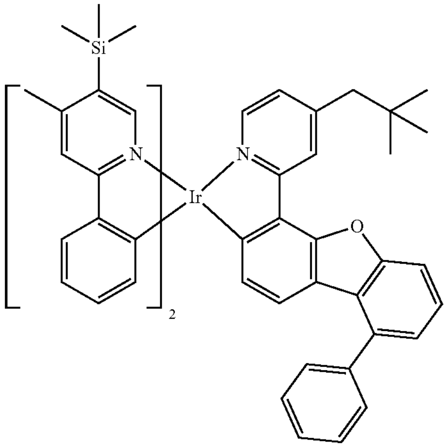
-continued
267
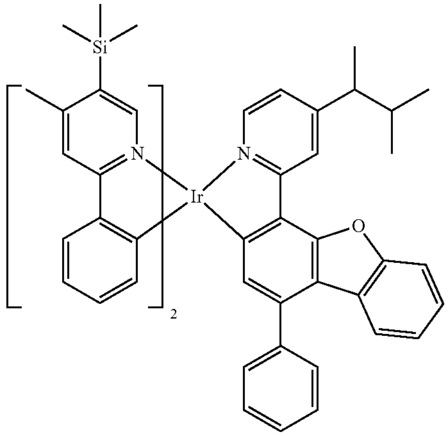
268
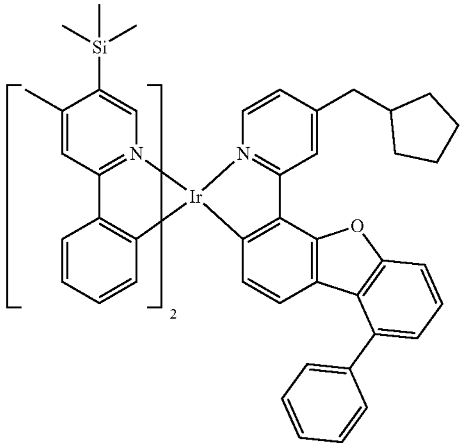
269
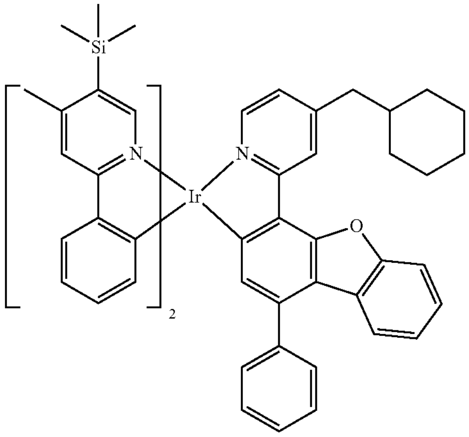

-continued
270
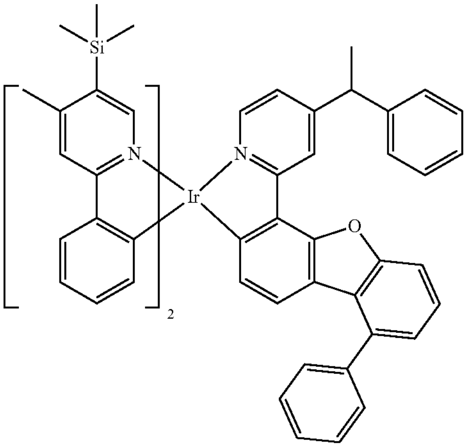
271
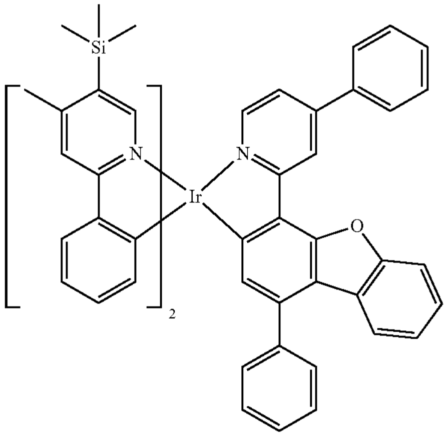
272
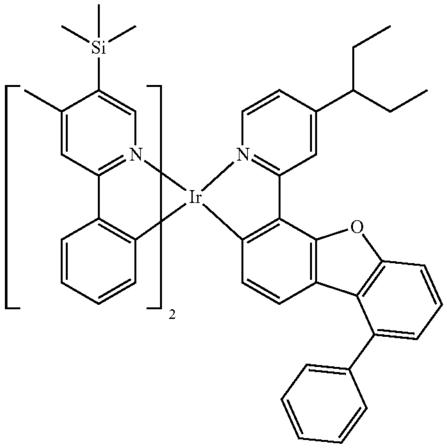
-continued
273
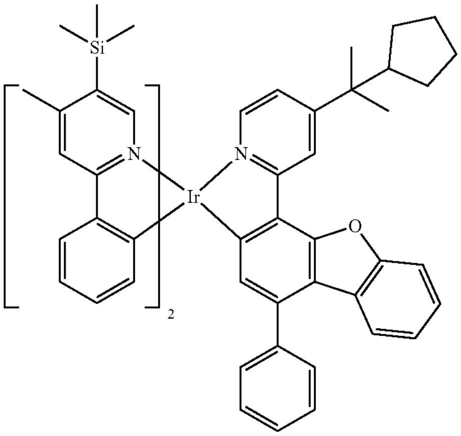
274
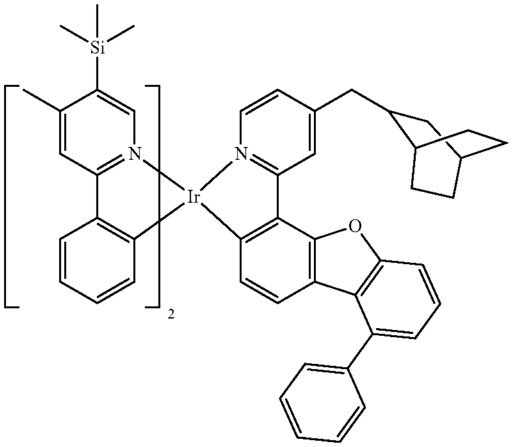
275
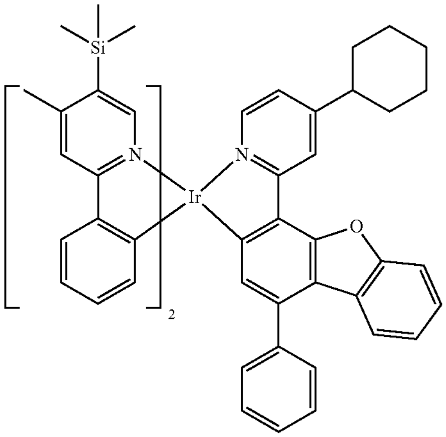

-continued
276
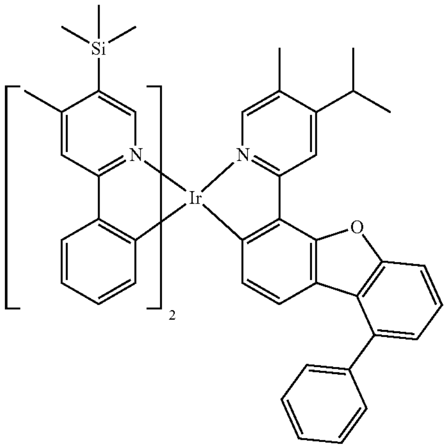
277
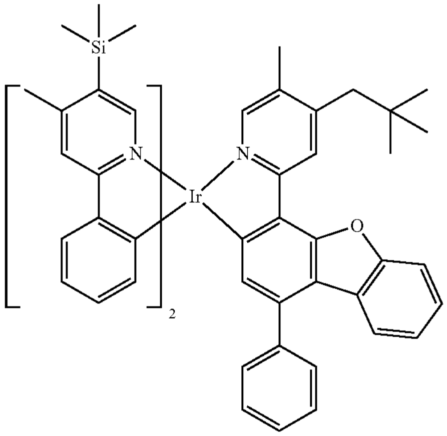
278
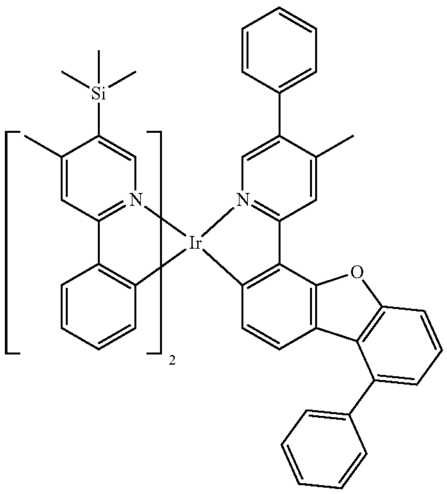
-continued
279
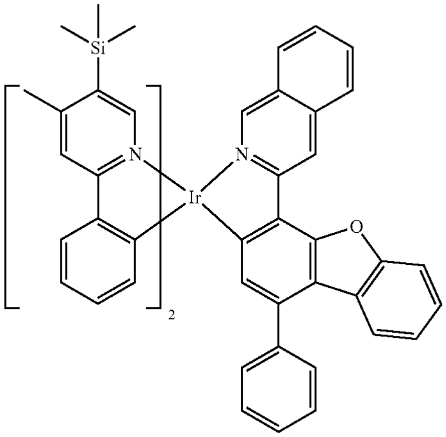
280
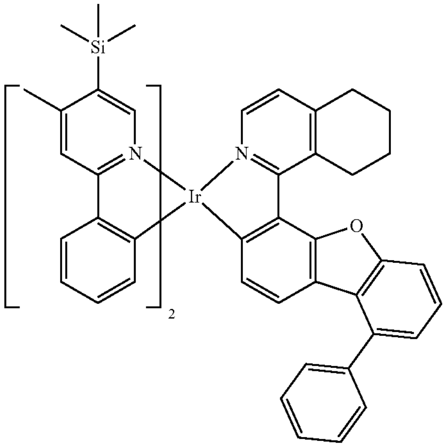
281
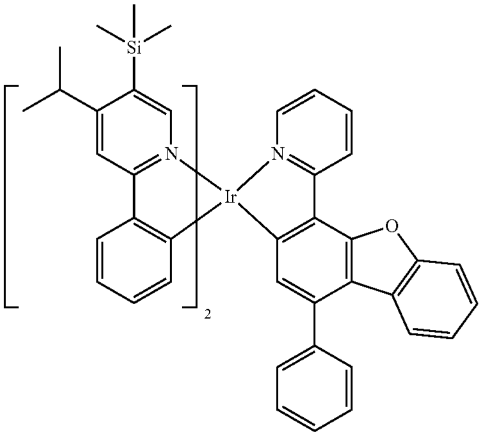

-continued
282
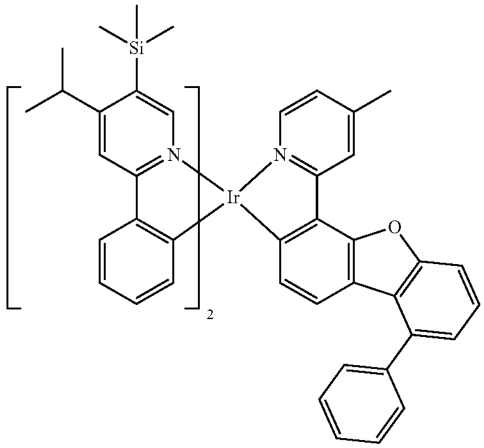
283
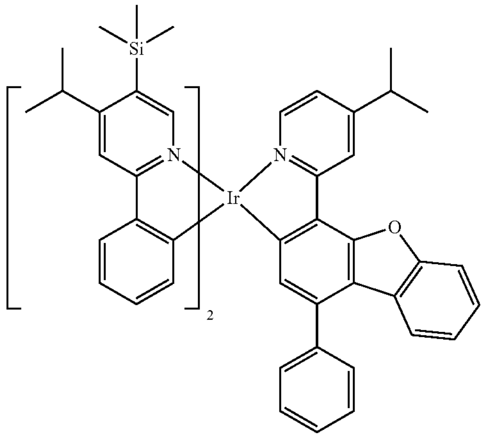
284
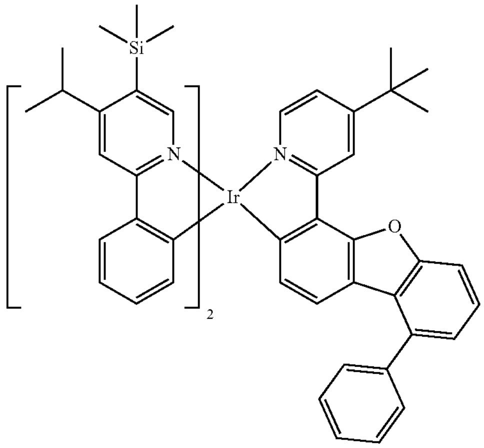
-continued
285
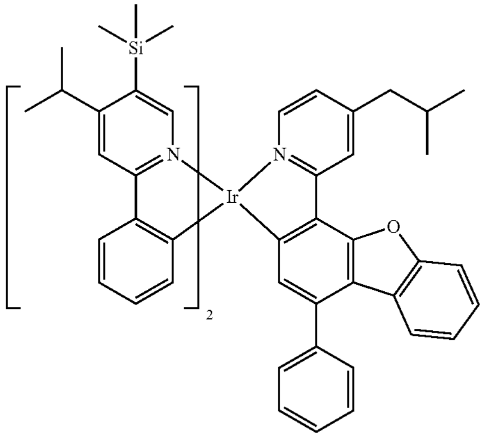
286
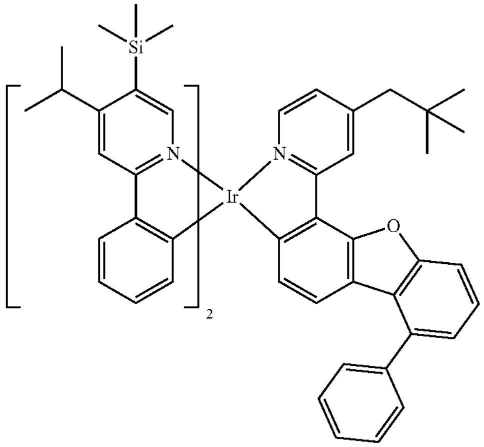
287
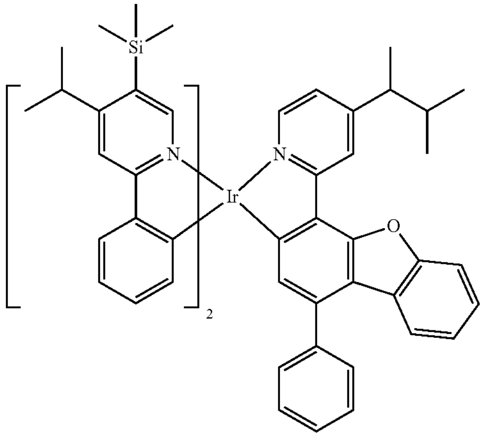

-continued
288
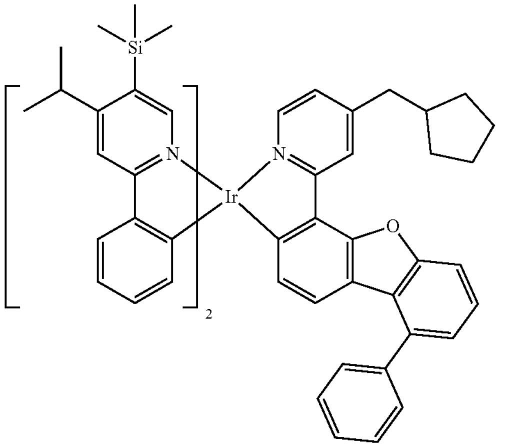
289
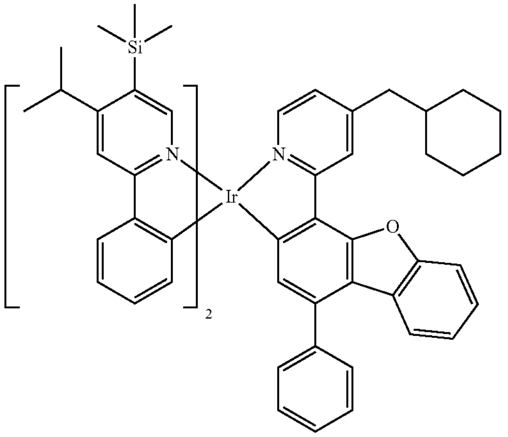
290
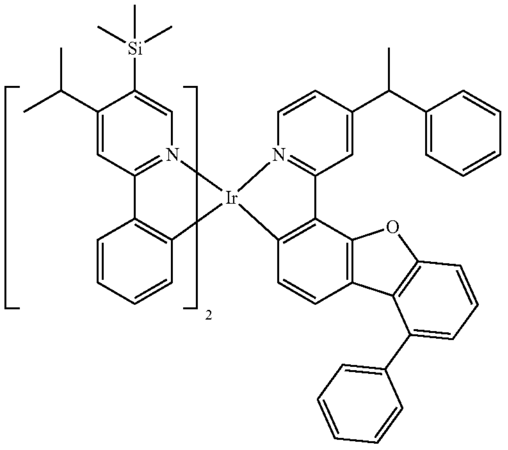
-continued
291
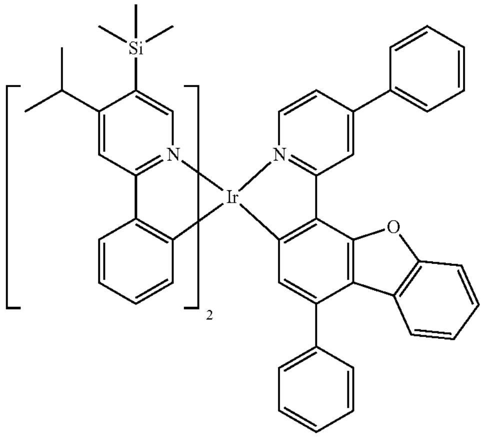
292
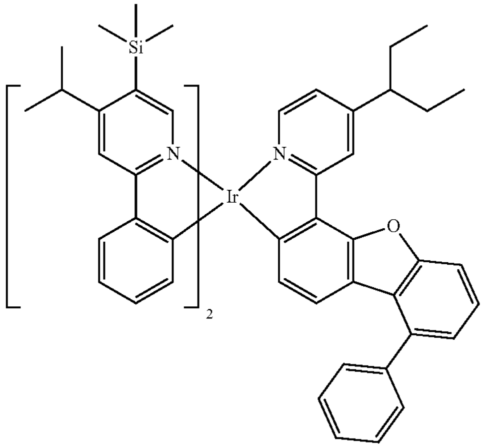
293
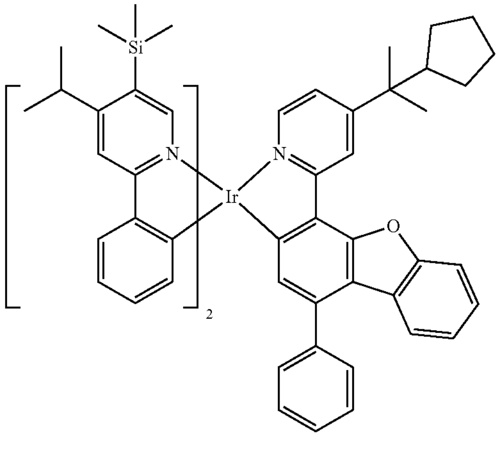

294
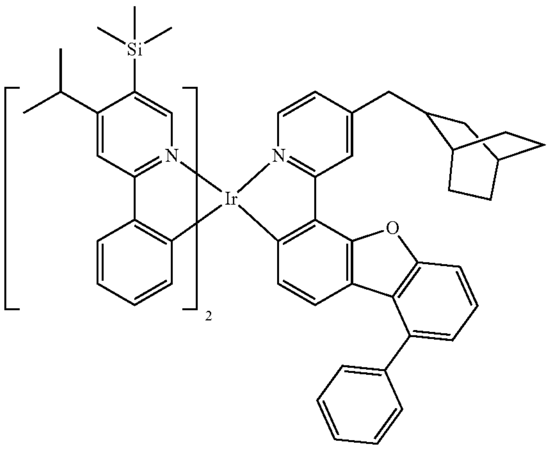
295
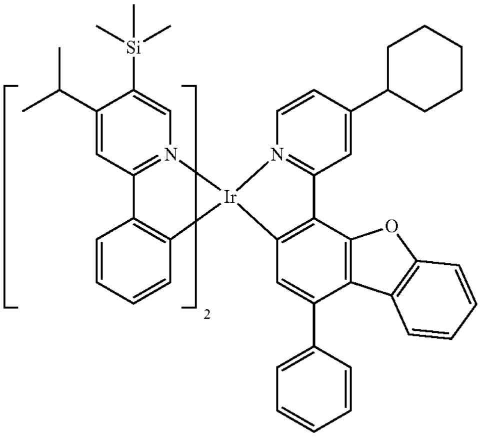
296
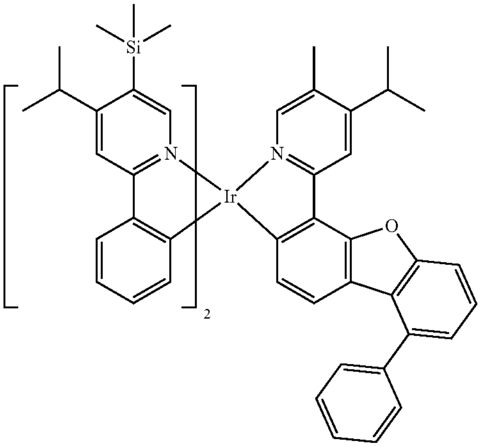
297
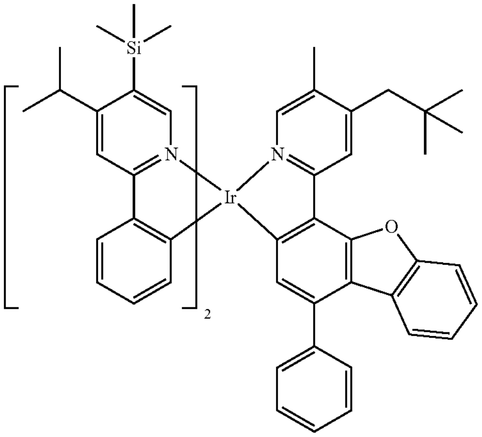
298
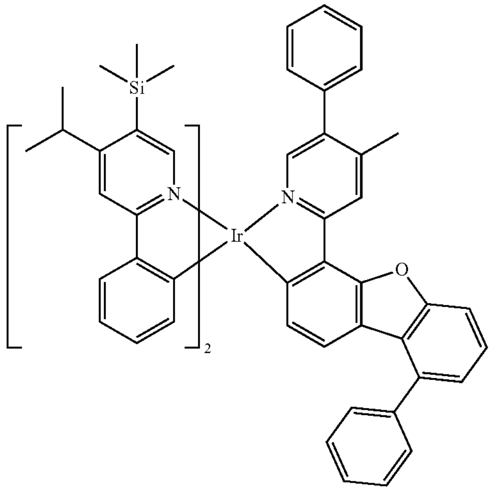
299
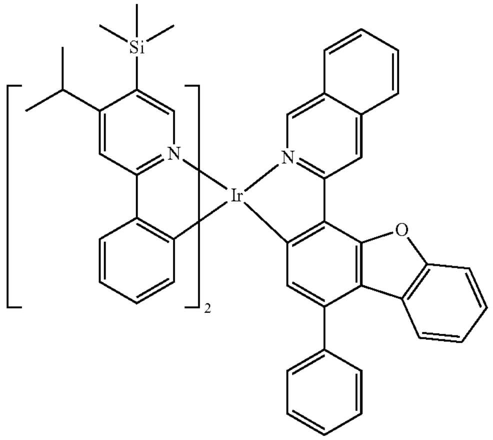

-continued
300
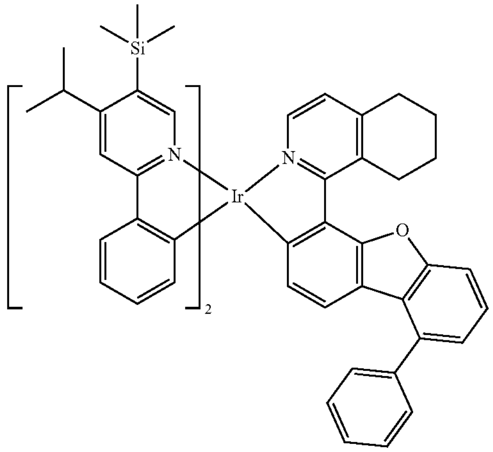
301
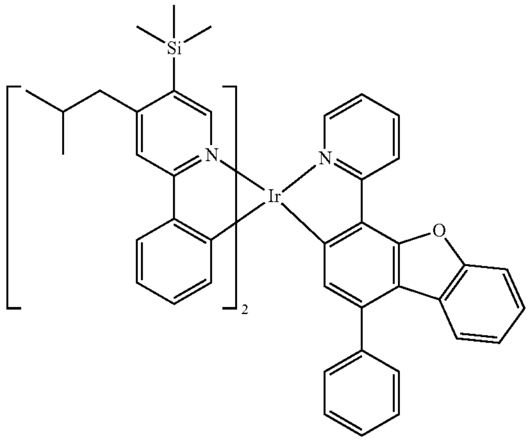
302
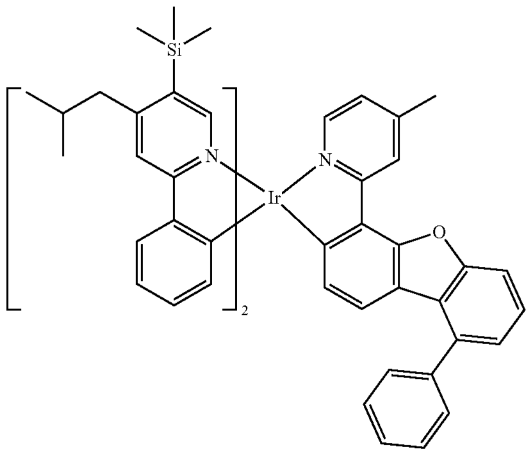
-continued
303
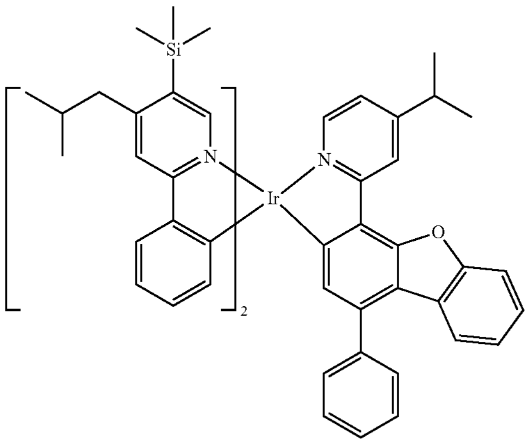
304
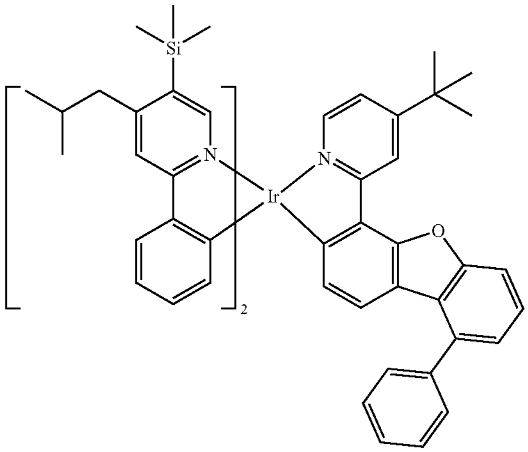
305
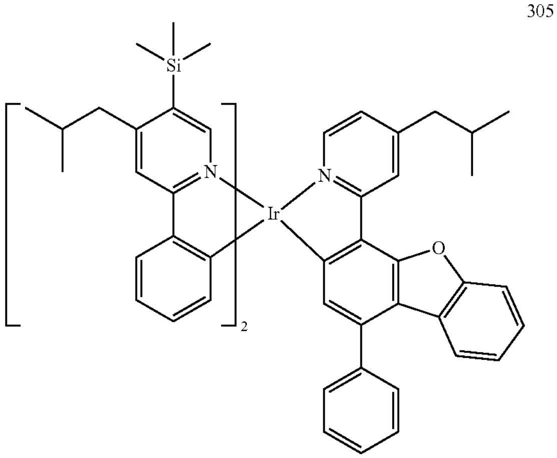

-continued
306
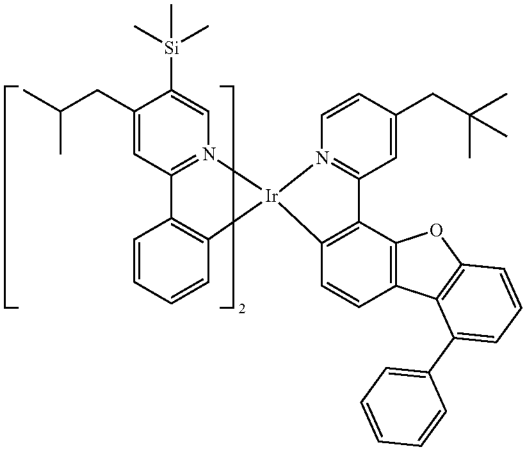
307
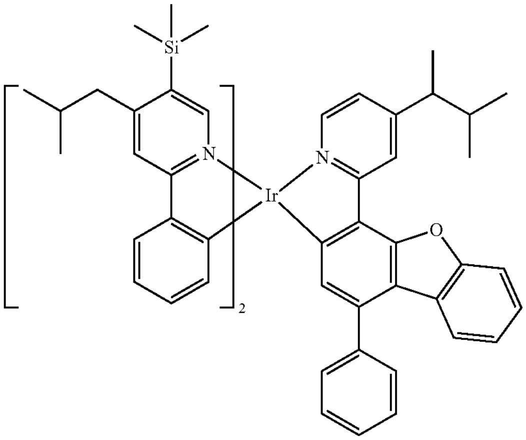
308
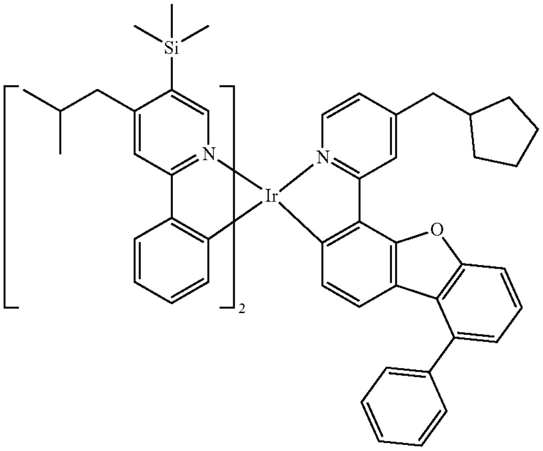
-continued
309
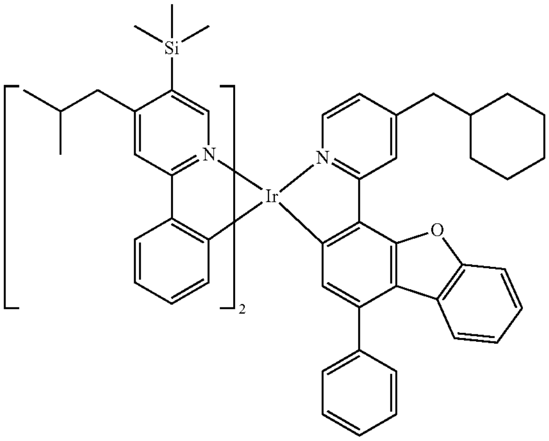
310
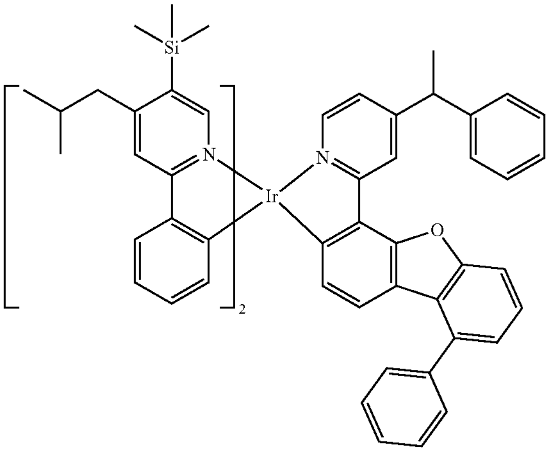
311
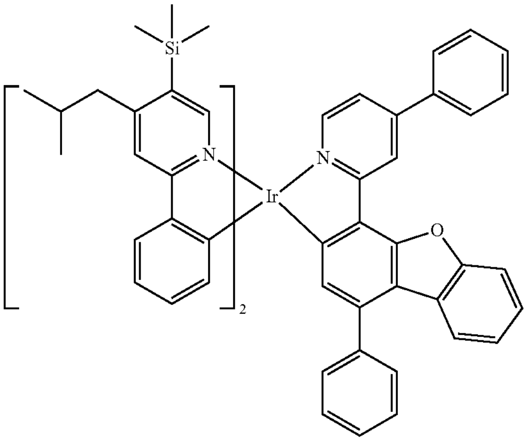

-continued
312
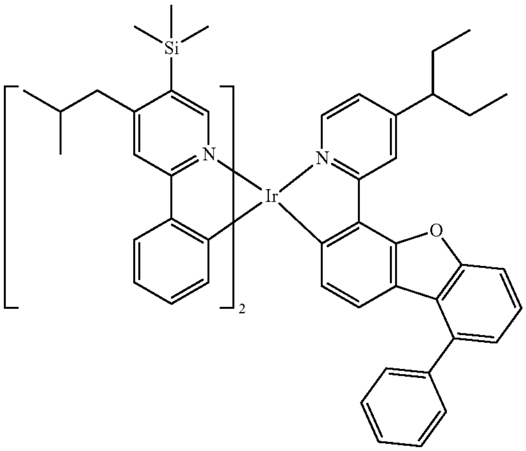
313
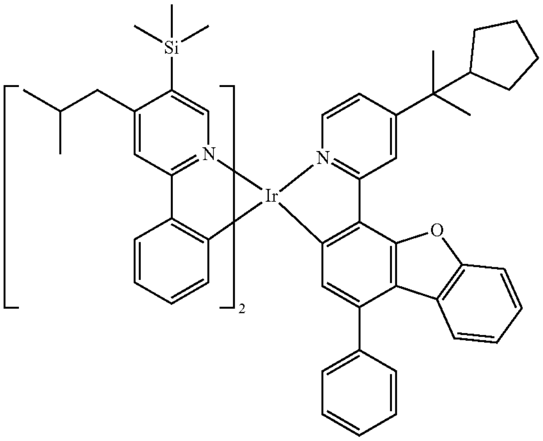
314
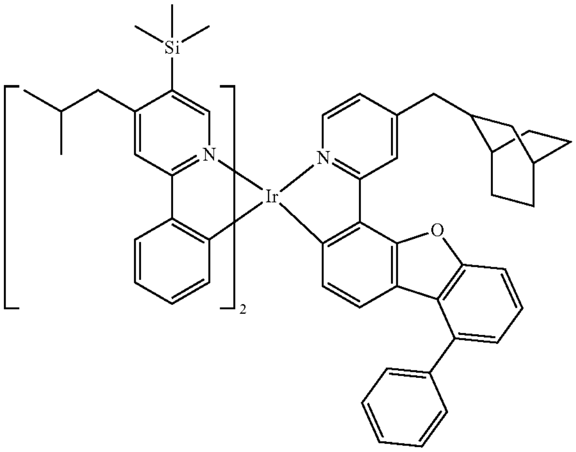
-continued
315
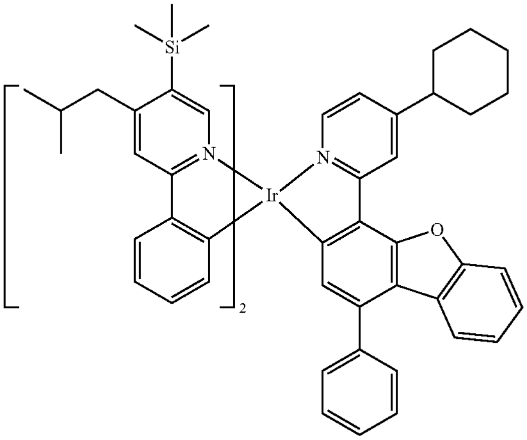
316
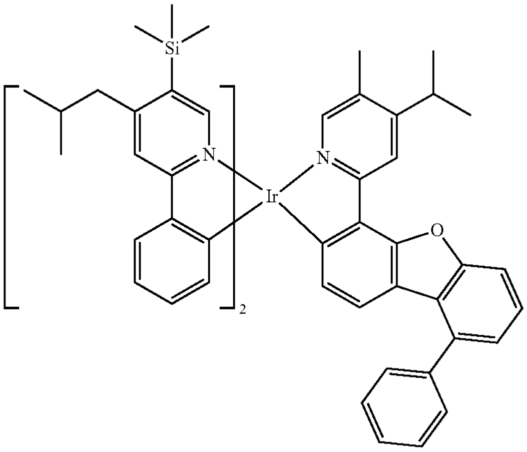
317
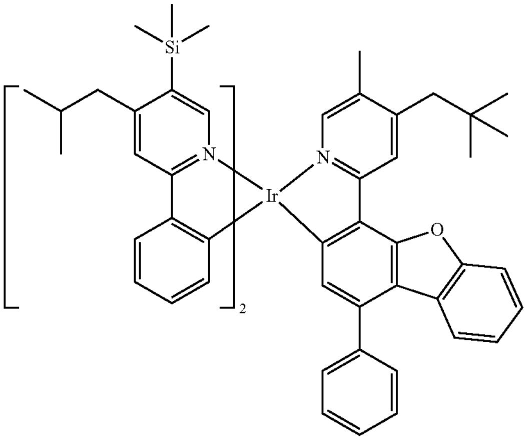

-continued
318
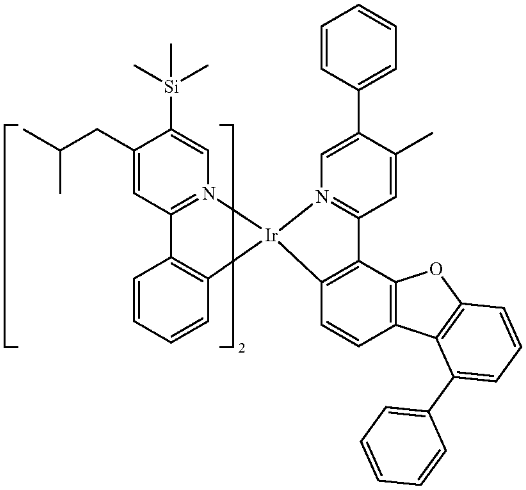
319
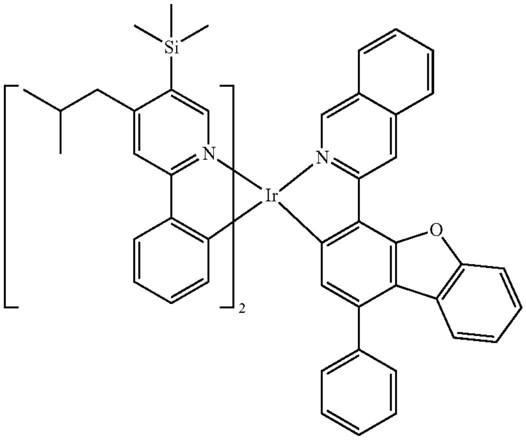
320
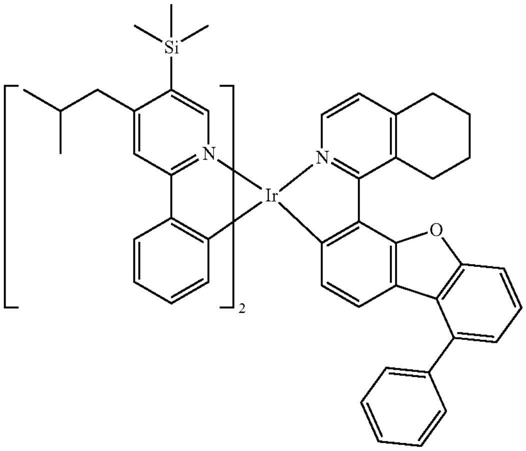
-continued
321
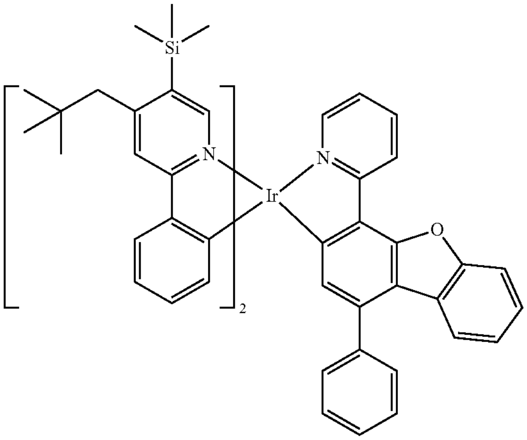
322
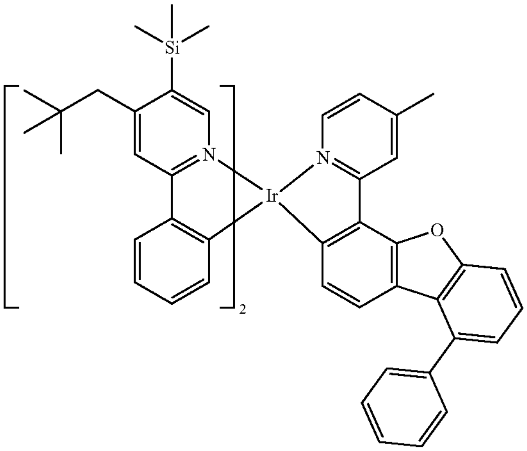
323
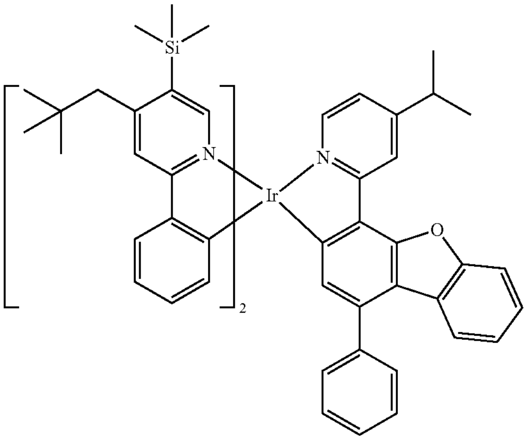

324
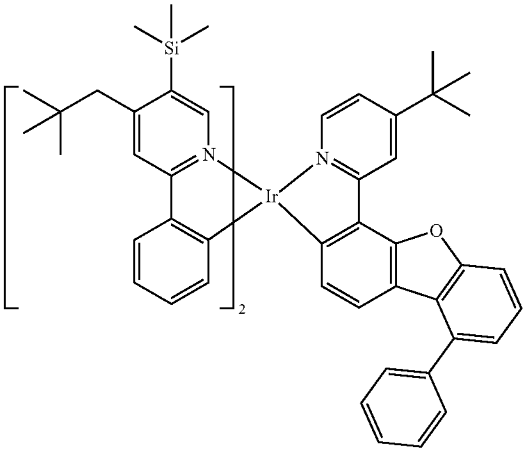
325
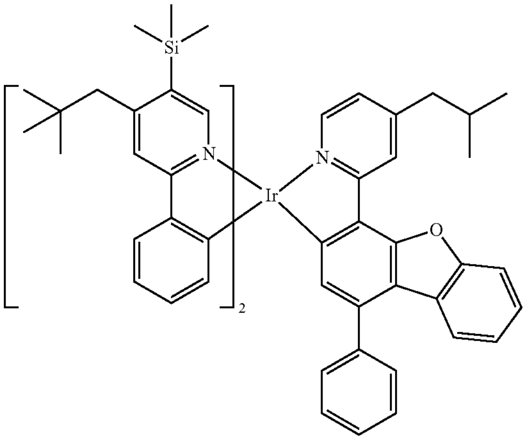
326
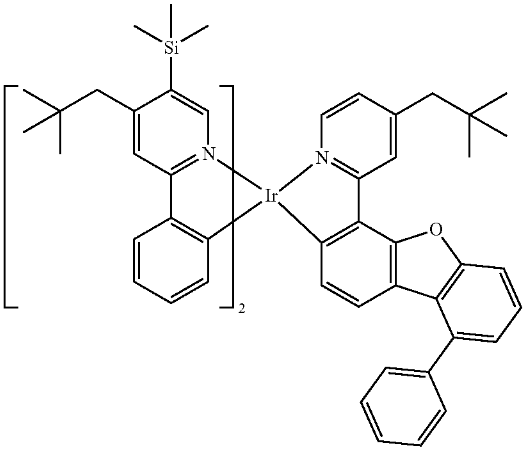
327
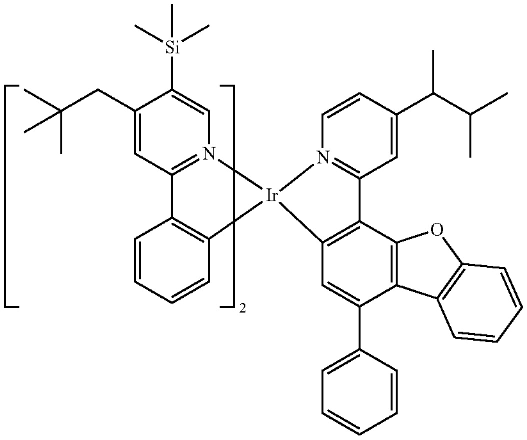
328
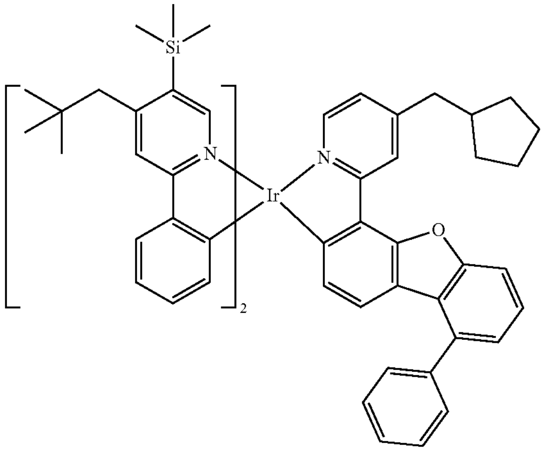
329
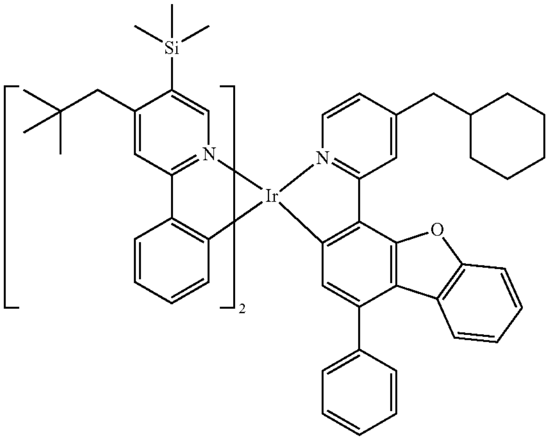

-continued
330
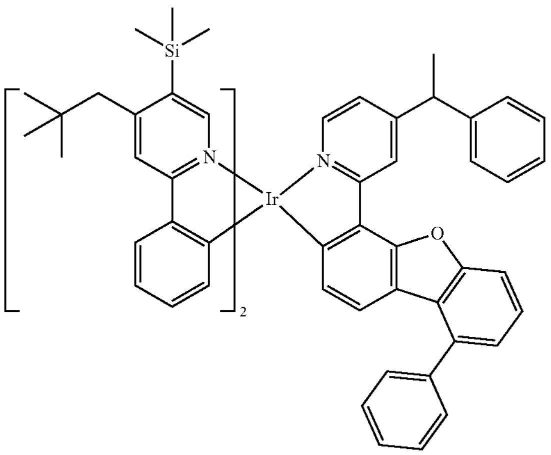
331
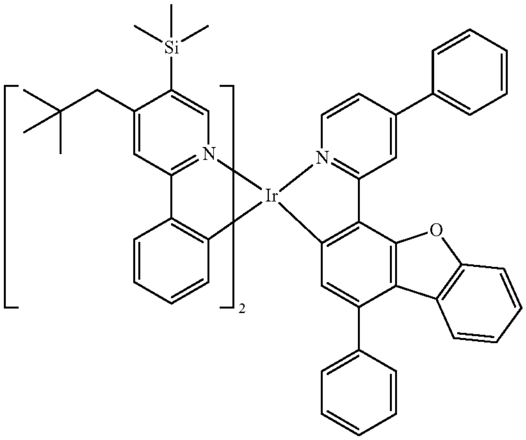
332
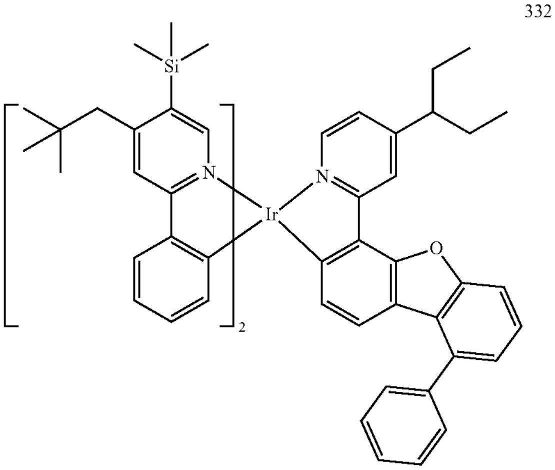
-continued
333
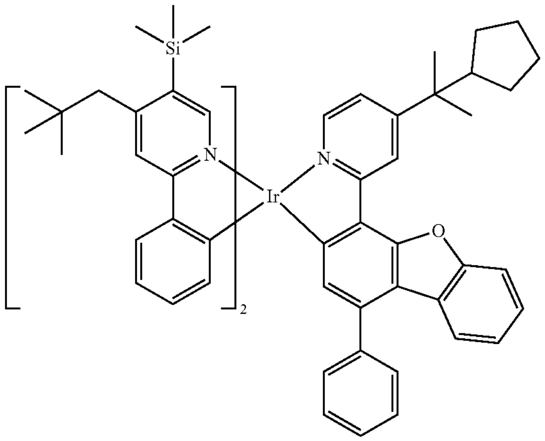
334
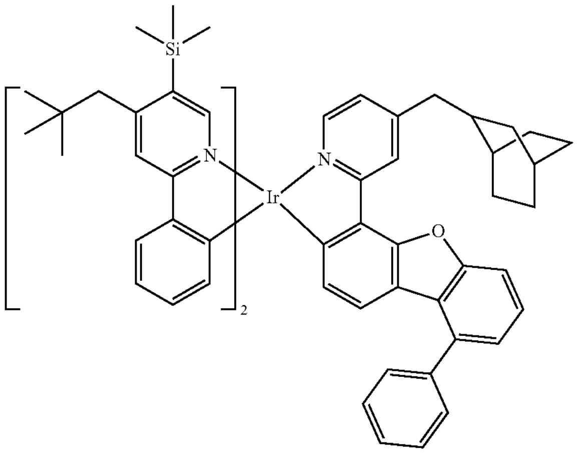
335
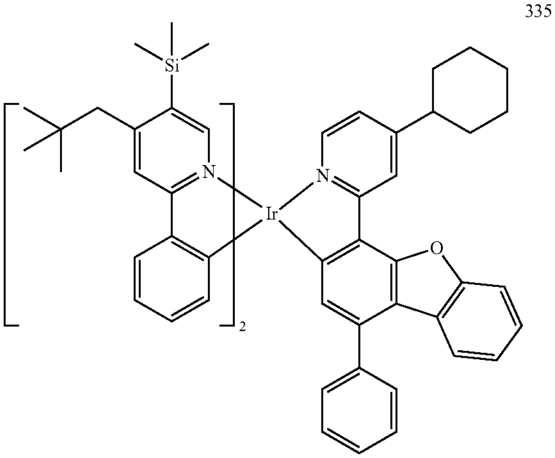

-continued
336
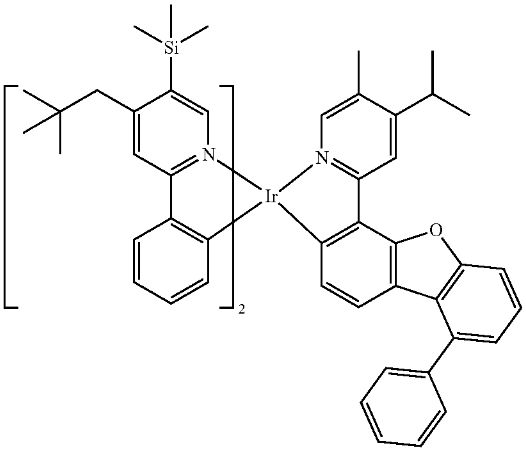
337
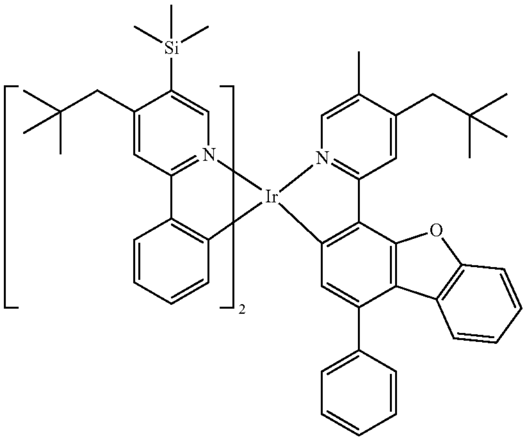
338
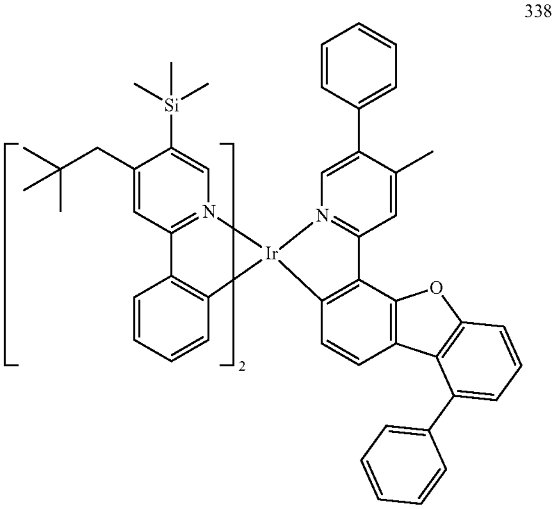
-continued
339
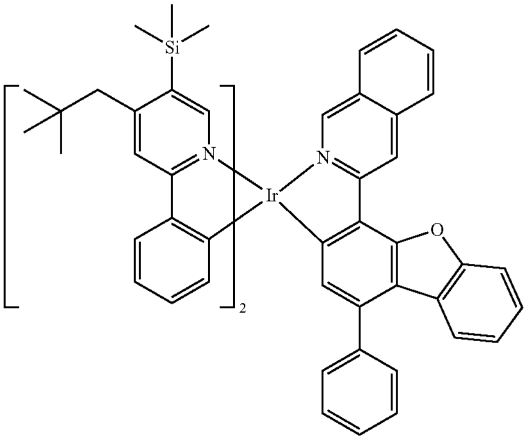
340
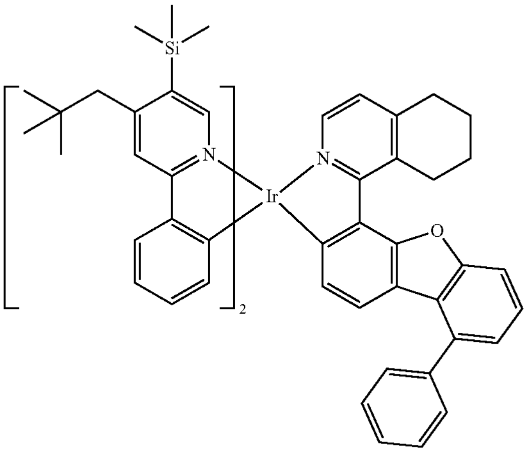
341
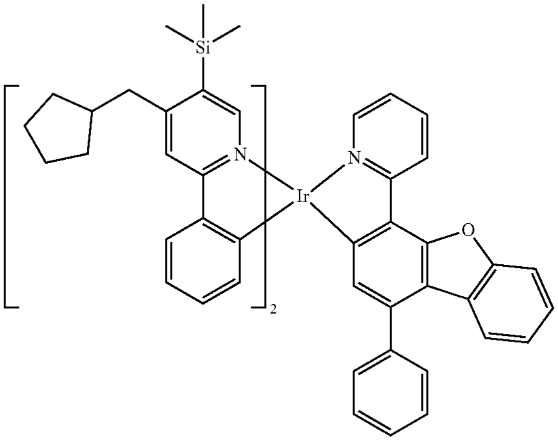

-continued
342
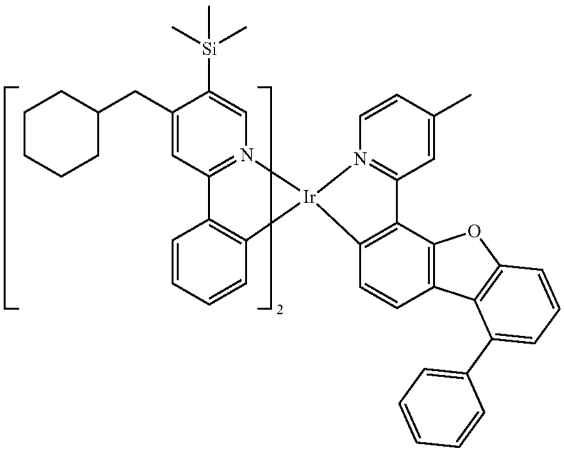
343
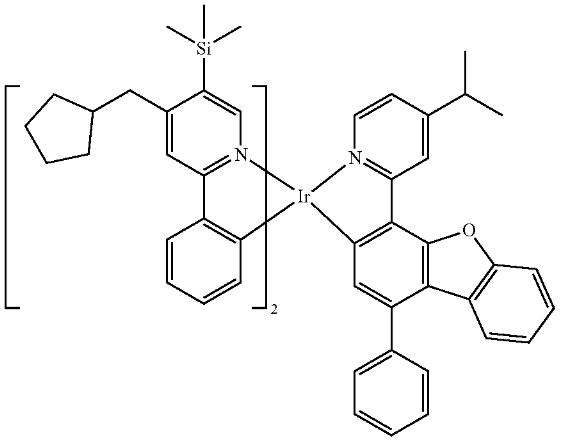
344
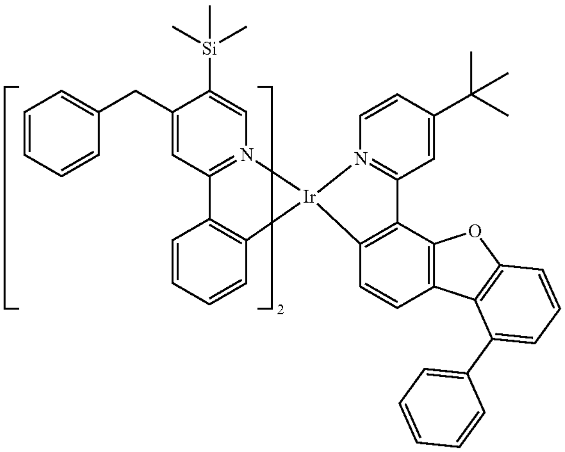
-continued
345
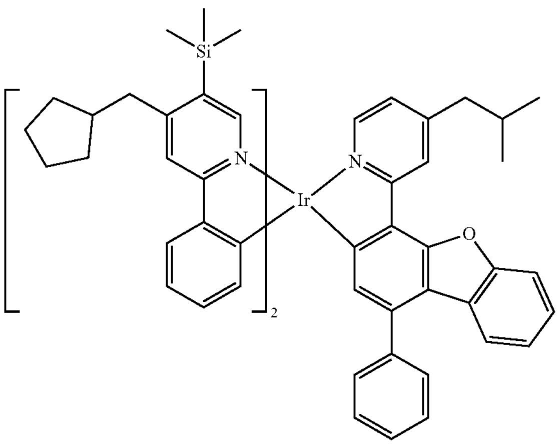
346
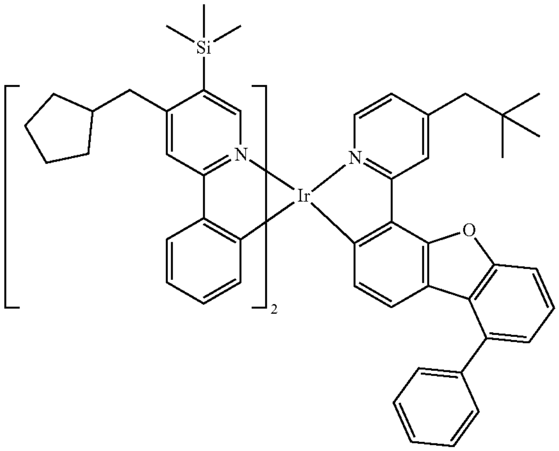
347
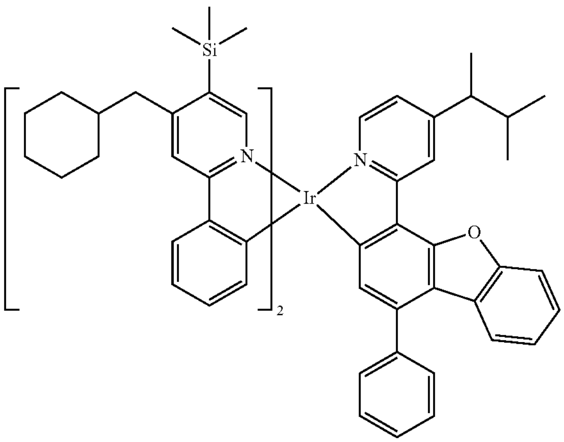

-continued
348
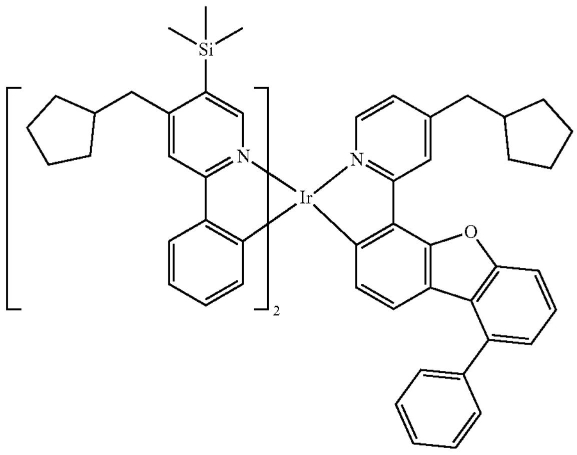
349
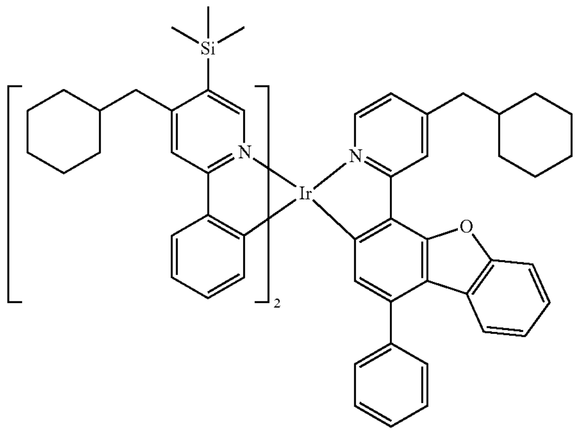
350
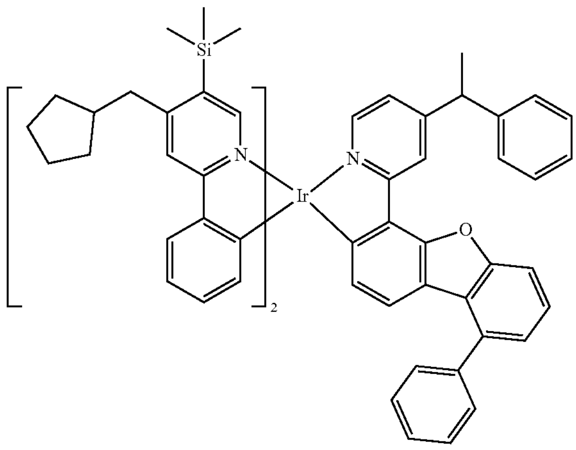
-continued
351
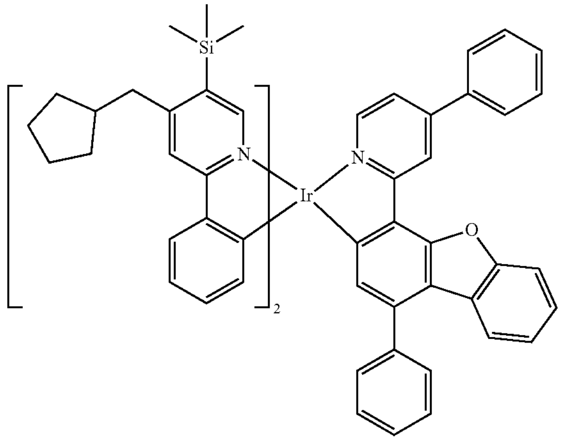
352
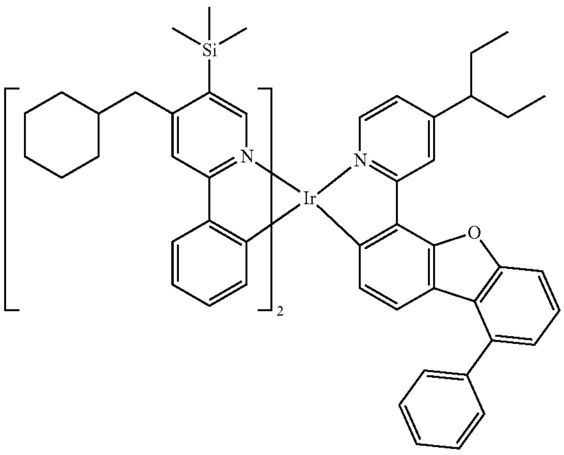
353
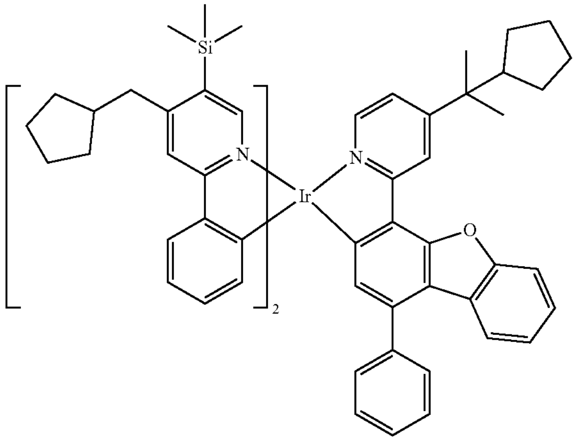

-continued
354
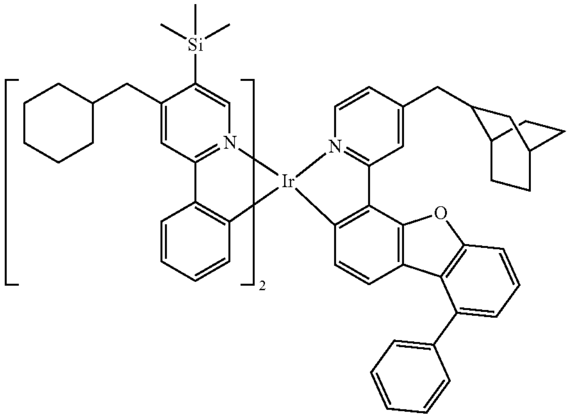
355
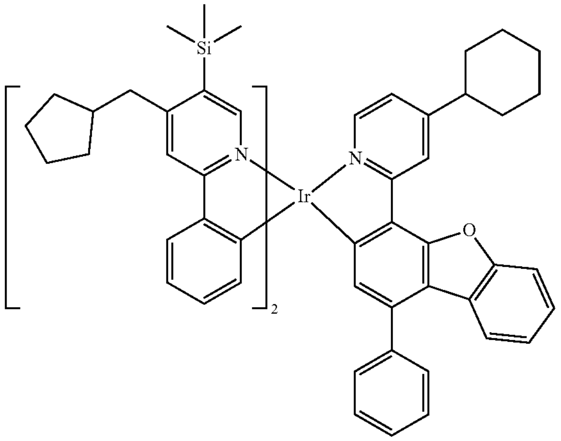
356
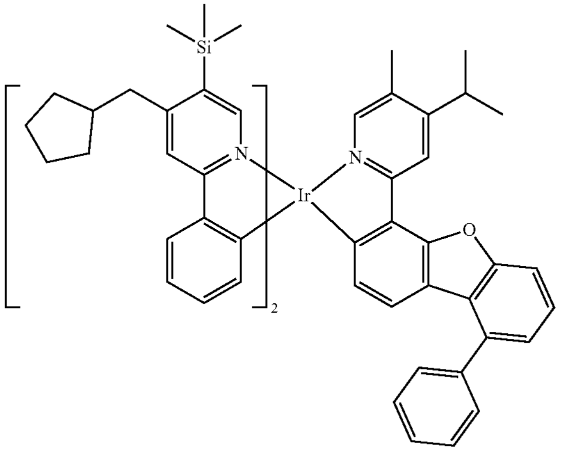
-continued
357
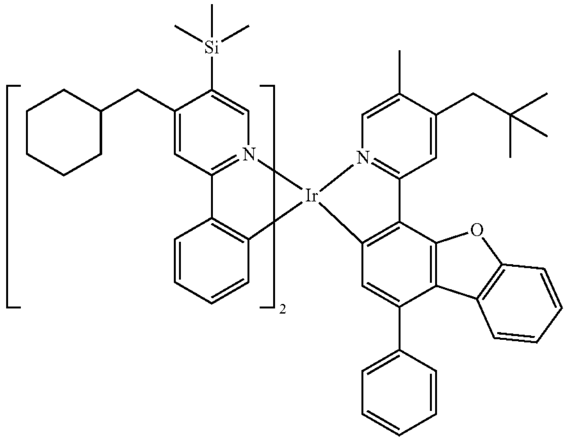
358
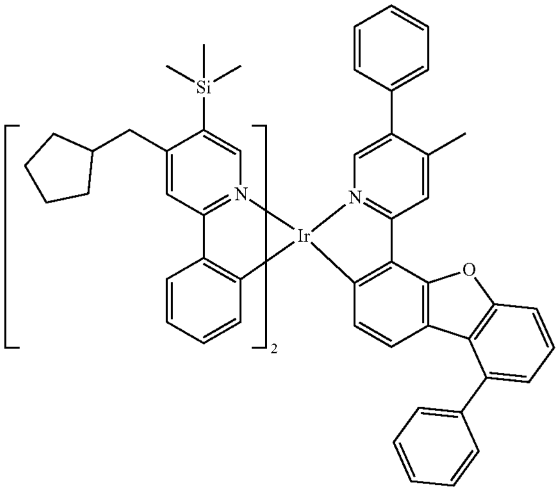
359
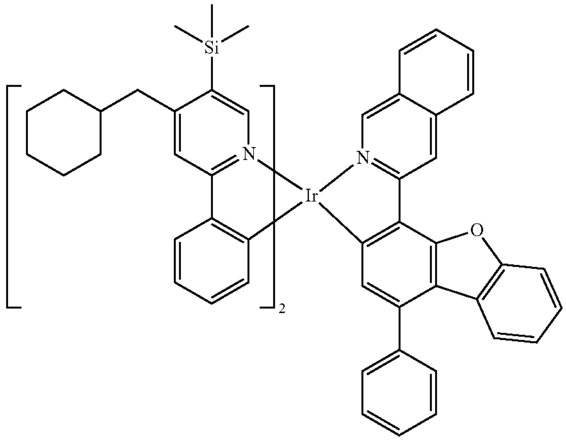

-continued
360
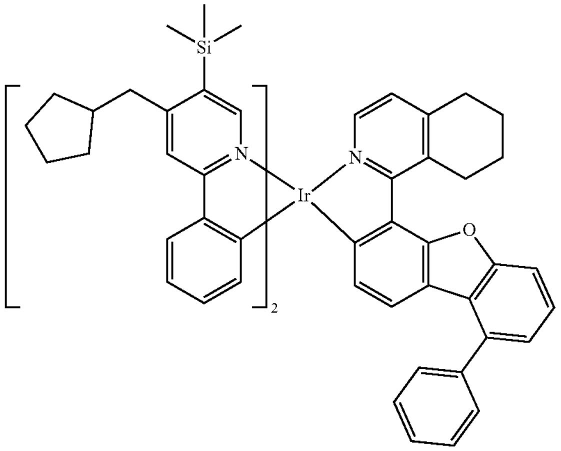
361
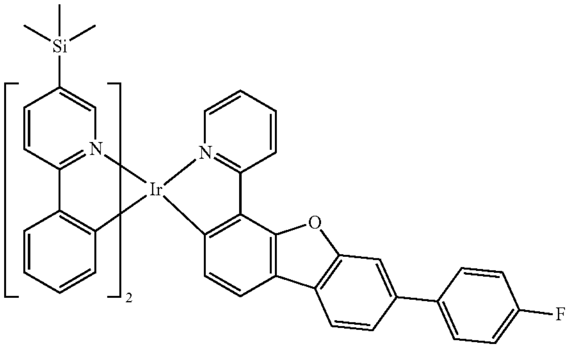
362
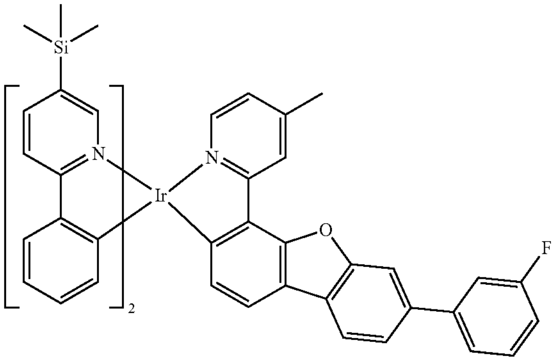
363
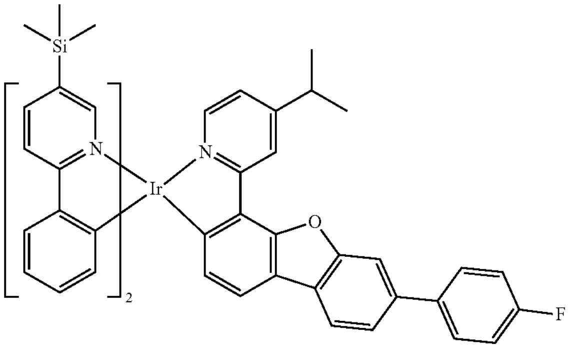
-continued
364
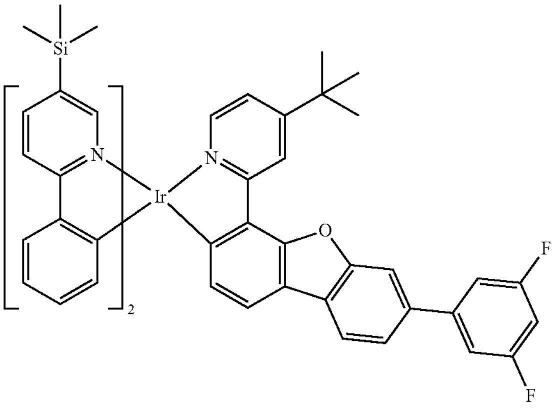
365
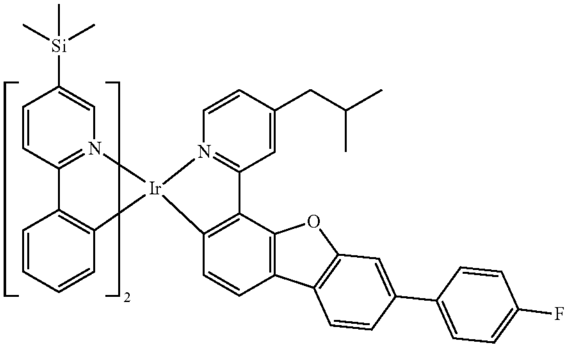
366
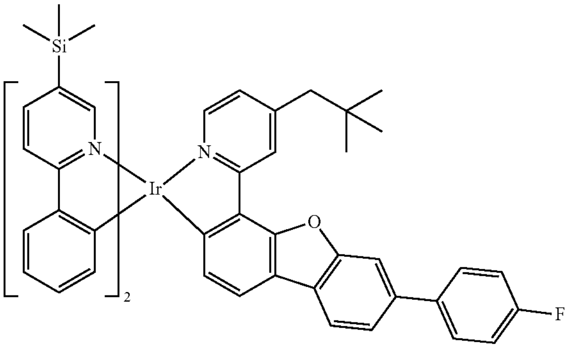
367
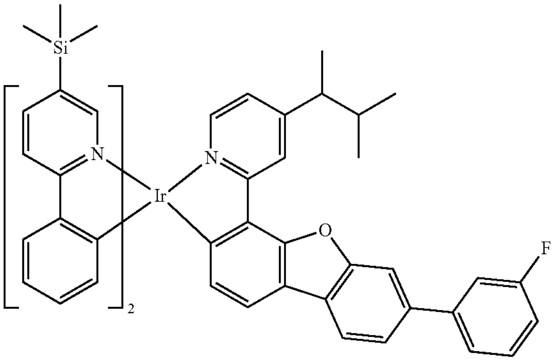

-continued
368
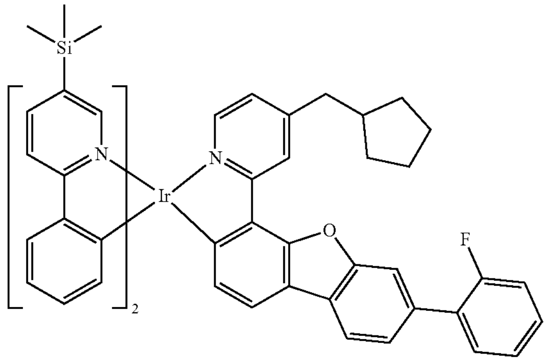
369
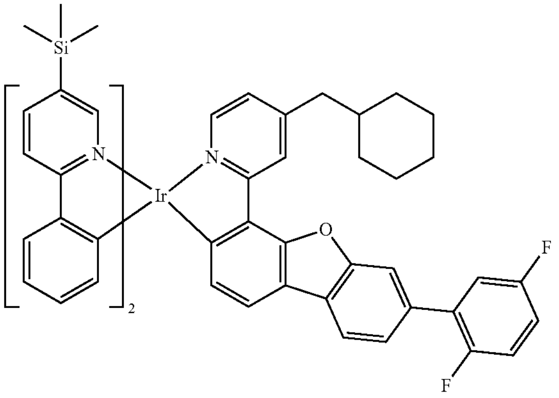
370
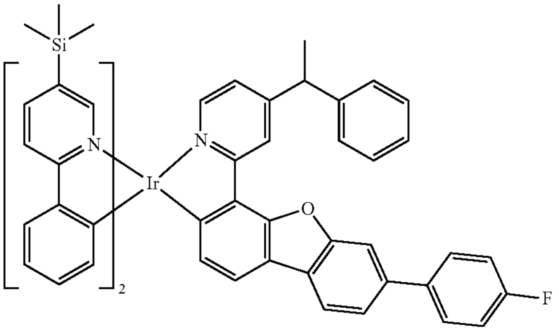
371
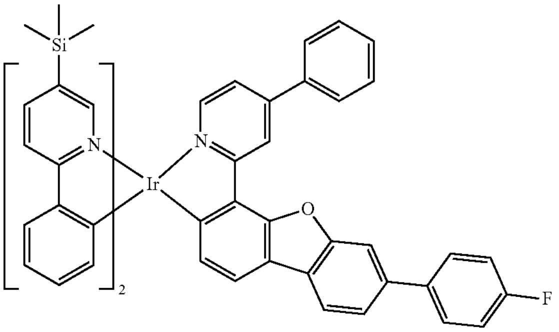
-continued
372
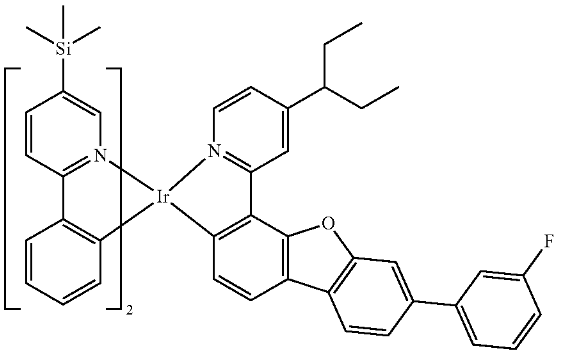
373
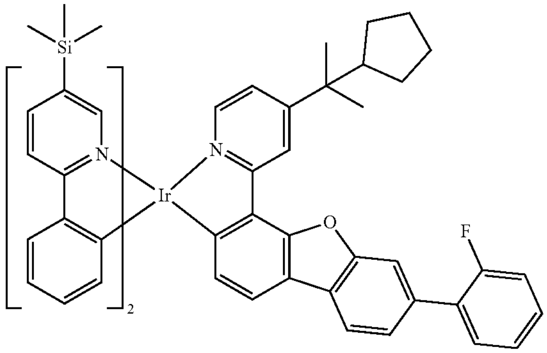
374
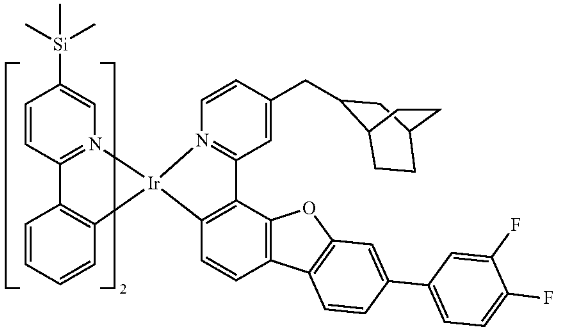
375
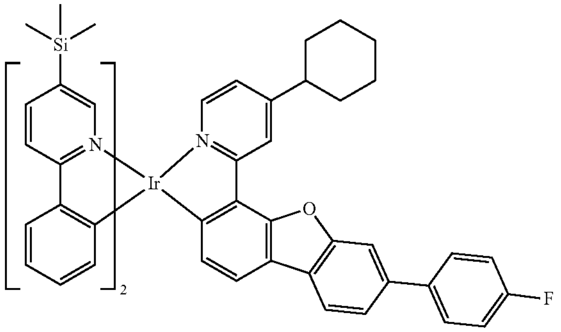

-continued
376
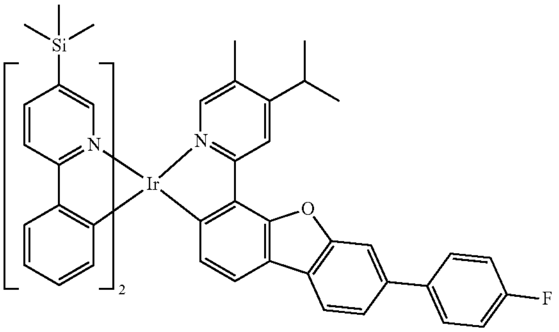
377
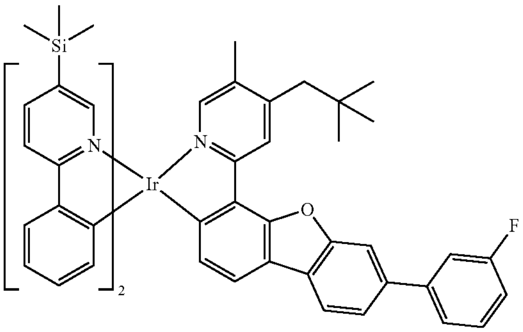
378
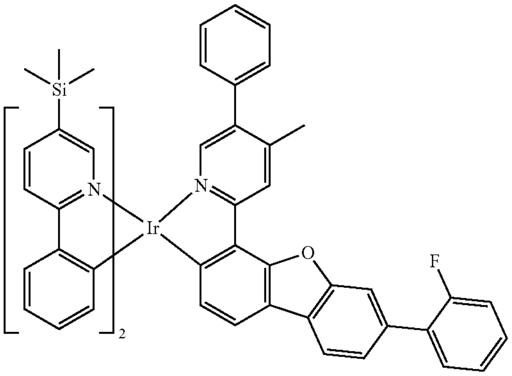
379
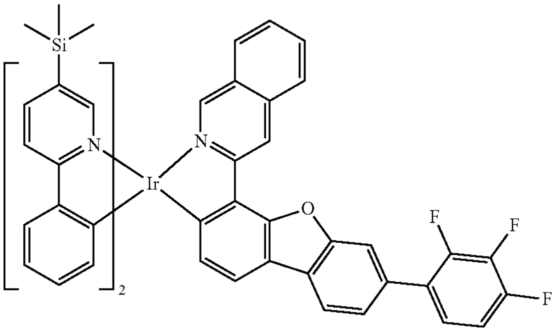
-continued
380
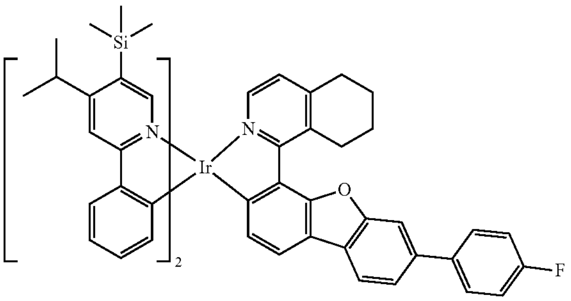
381
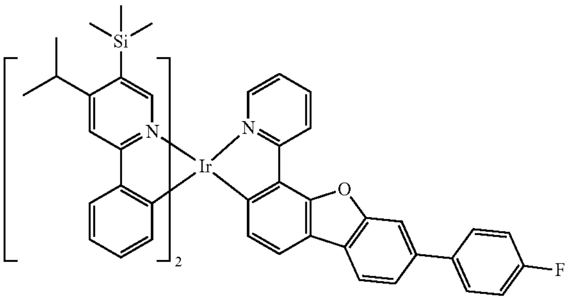
382
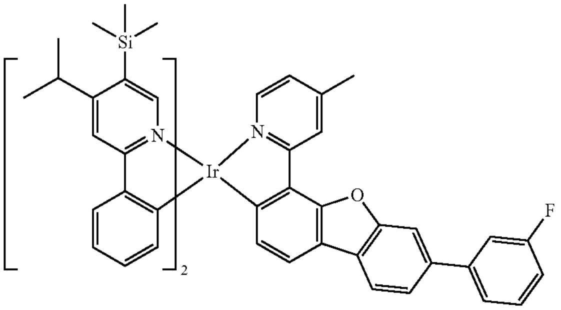
383
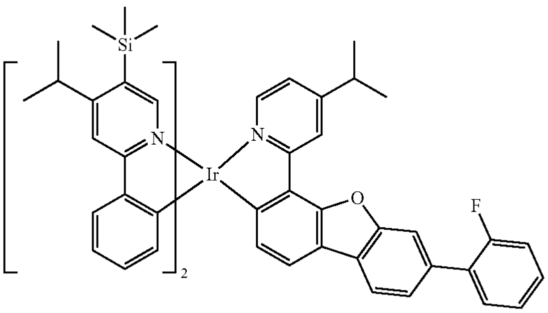

-continued
384
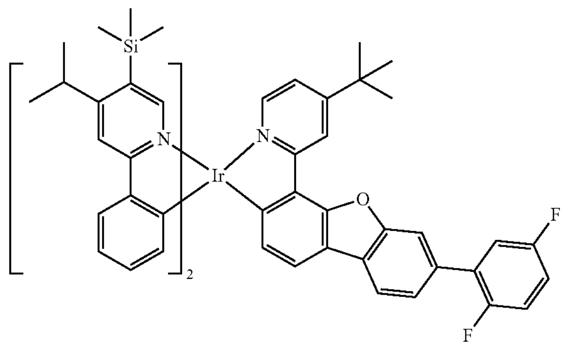
385
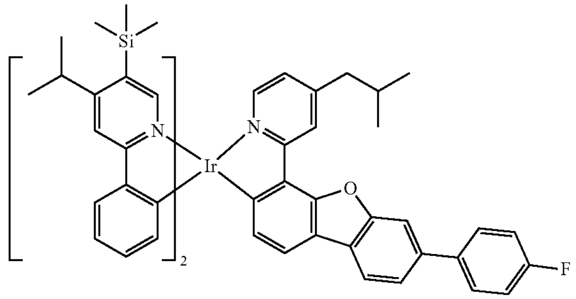
386
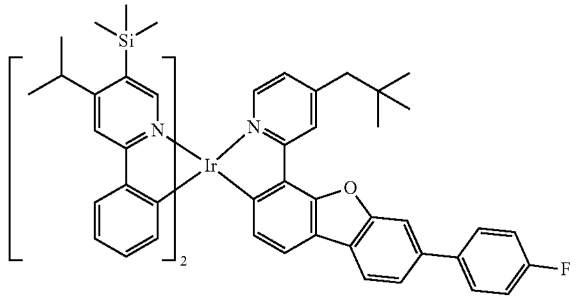
387
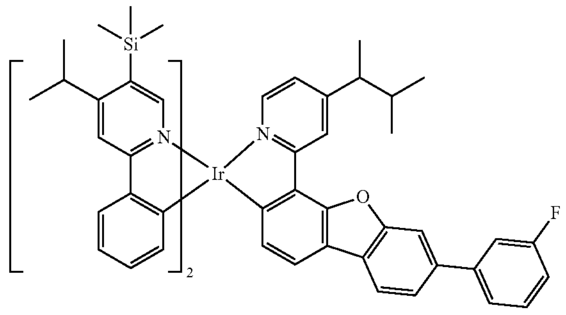
-continued
388
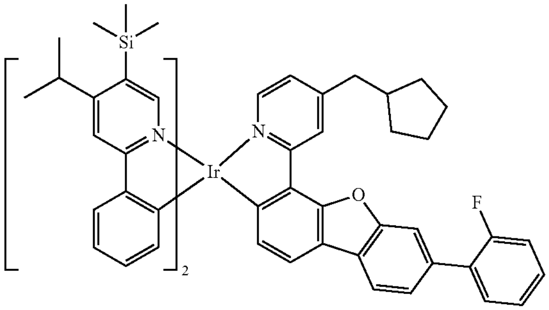
389
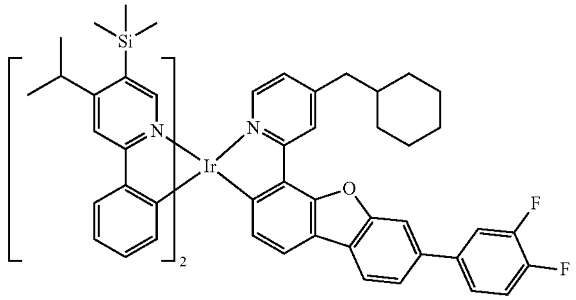
390
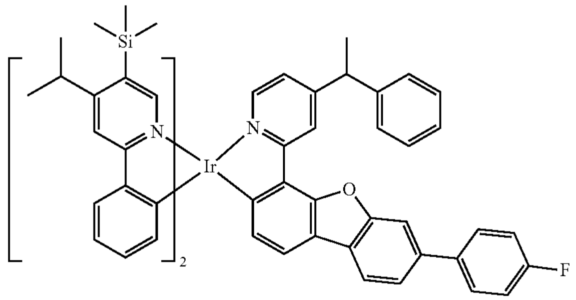
391
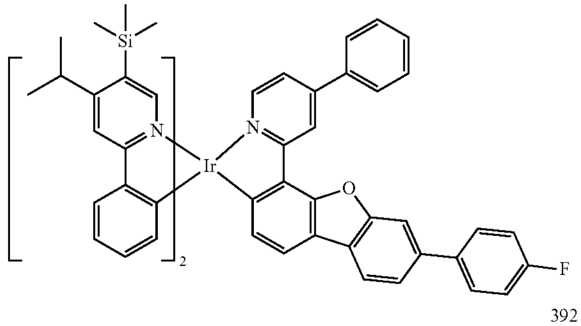
392
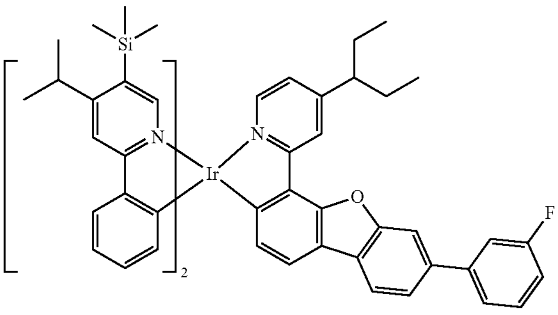

-continued
393
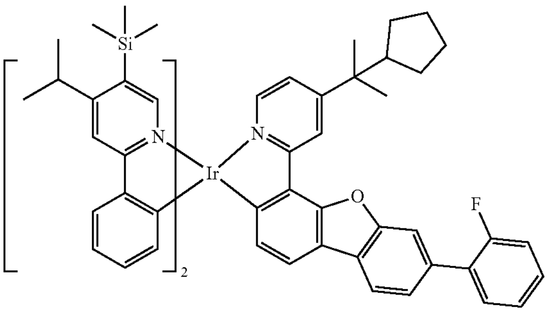
394
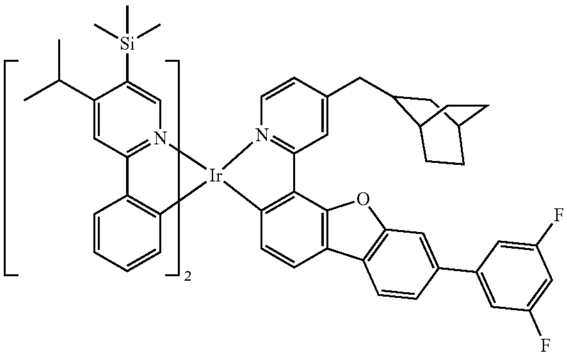
395
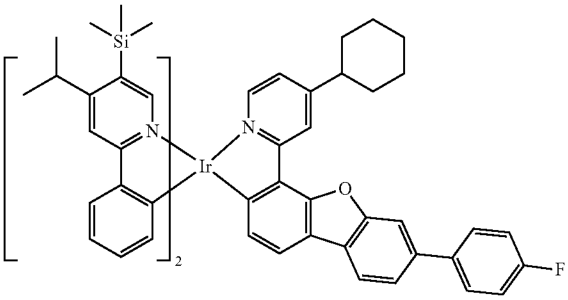
396
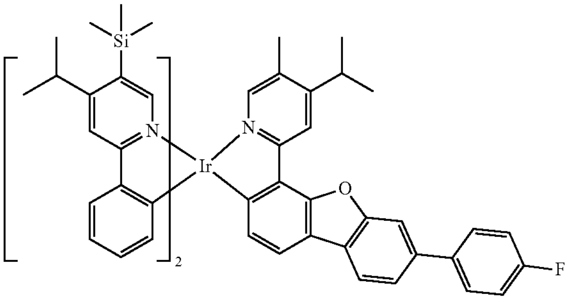
-continued
397
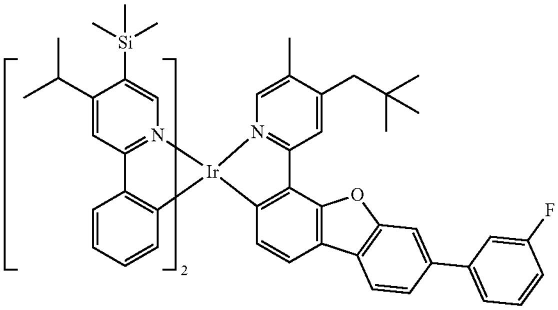
398
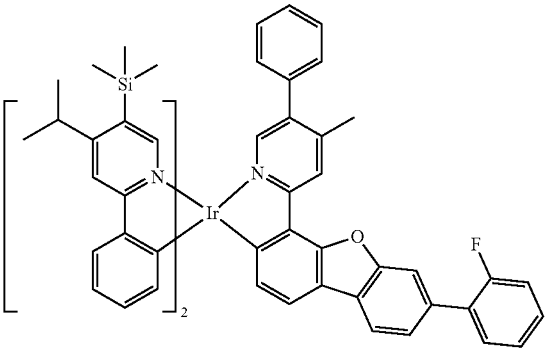
399
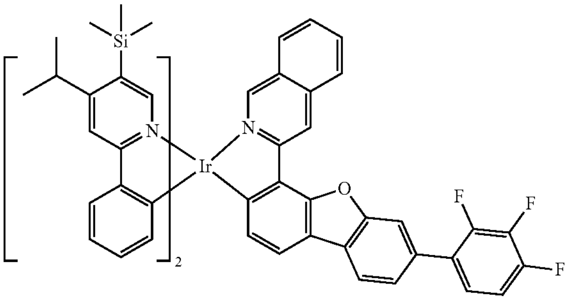
400
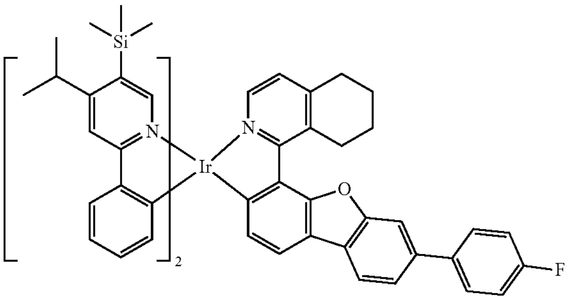

-continued
401
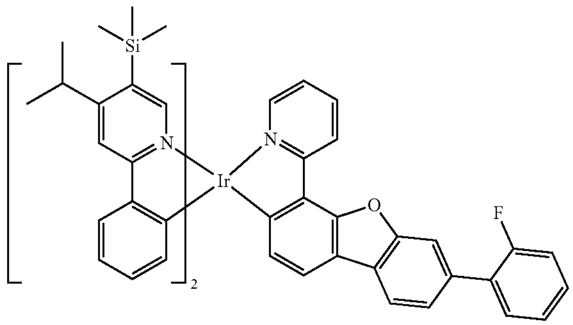
402
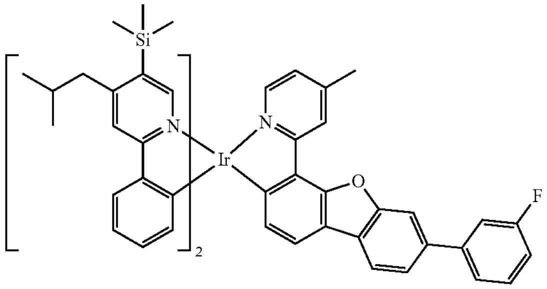
403
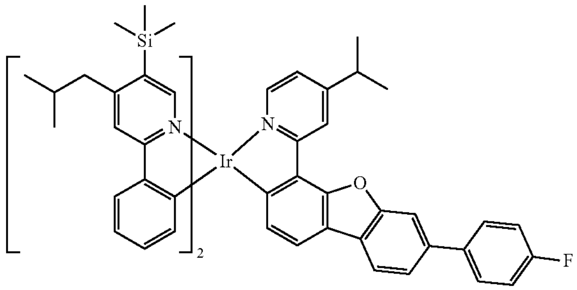
404
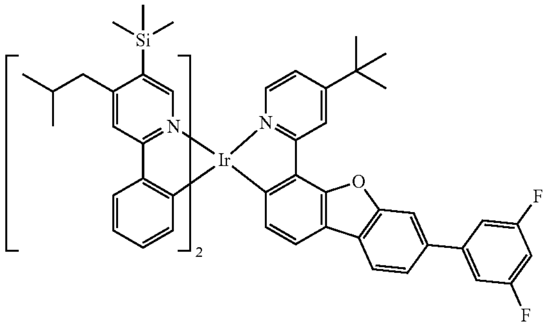
-continued
405
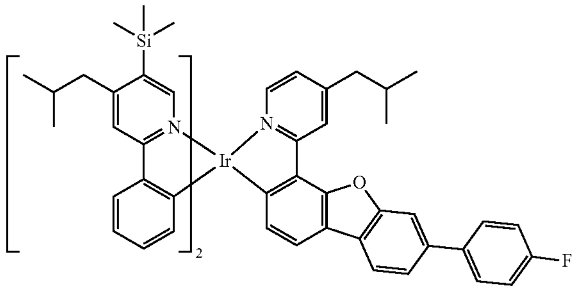
406
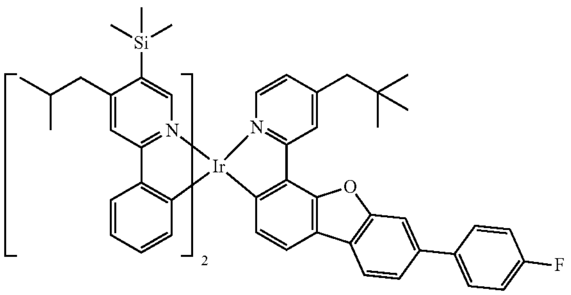
407
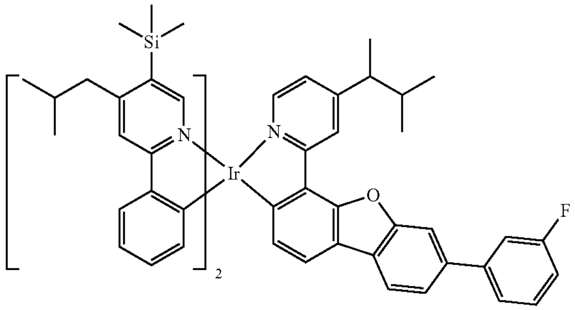
408
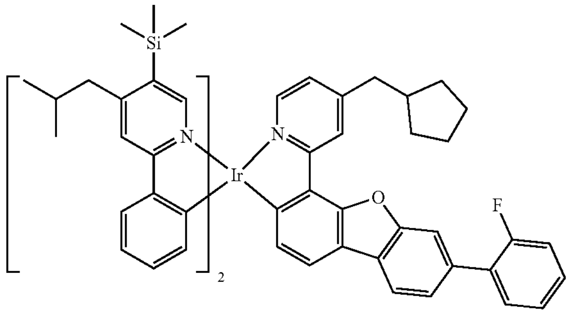

-continued
409
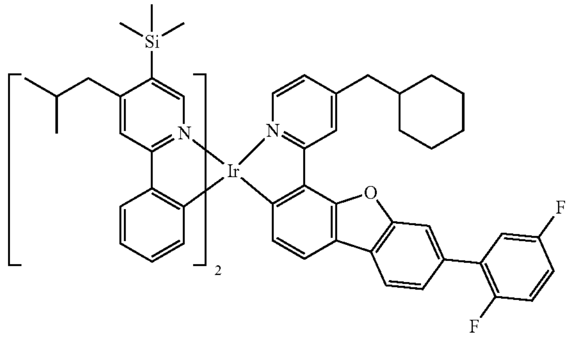
410
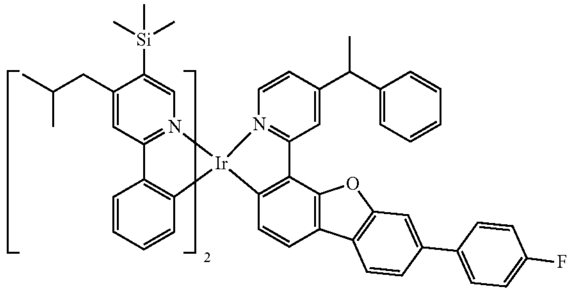
411
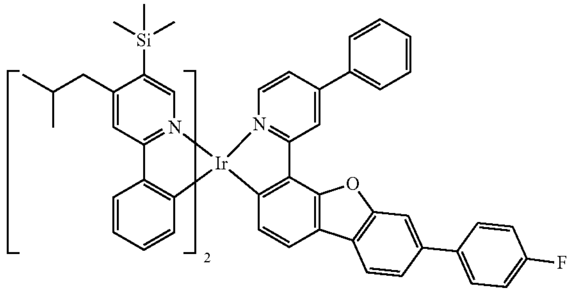
412
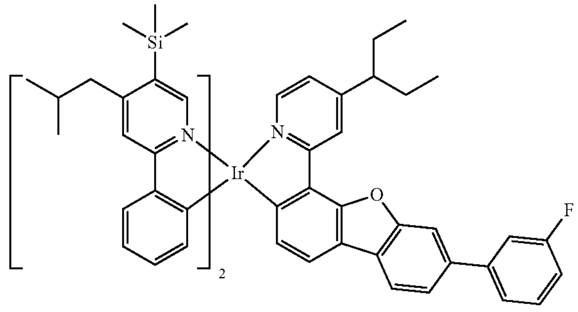
-continued
413
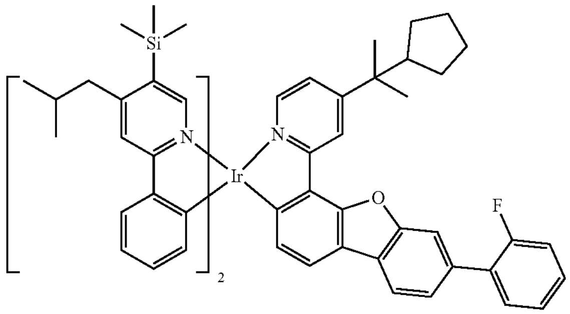
414
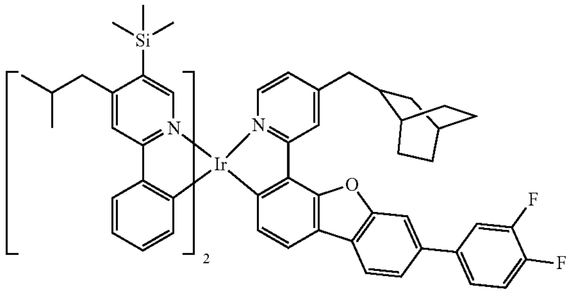
415
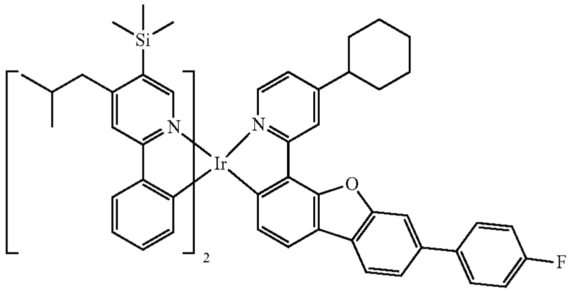
416
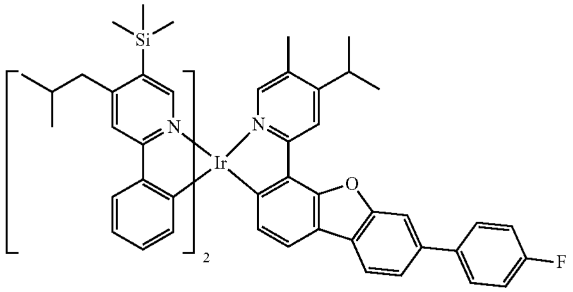
417
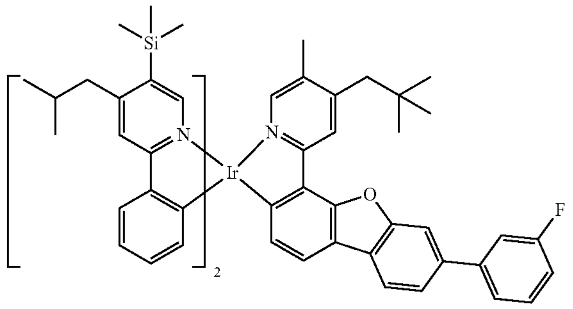

-continued
418
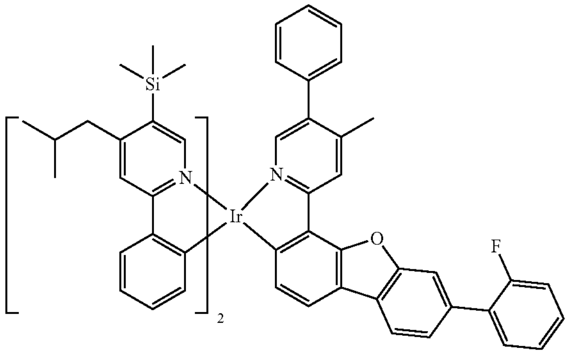
419
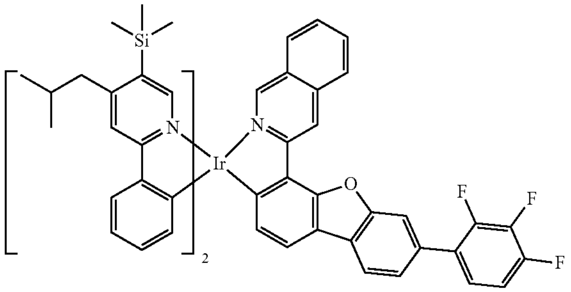
420
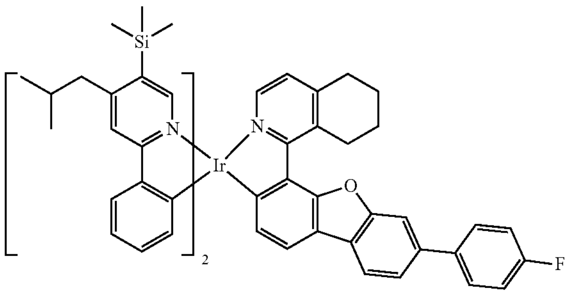
421
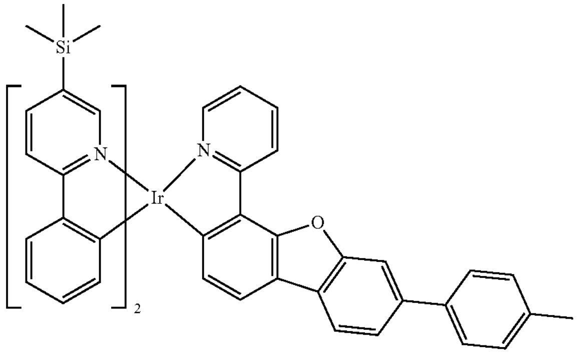
-continued
422
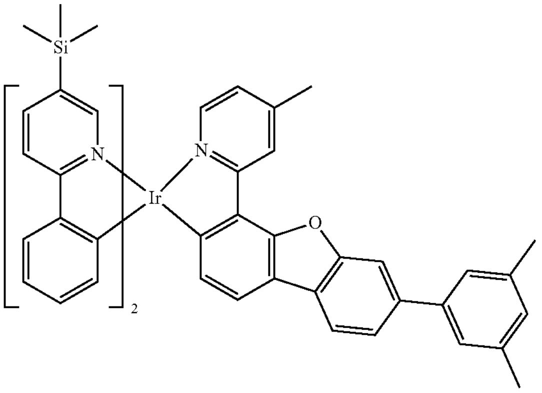
423
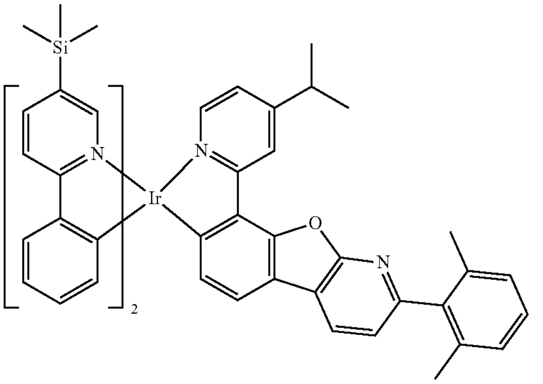
424
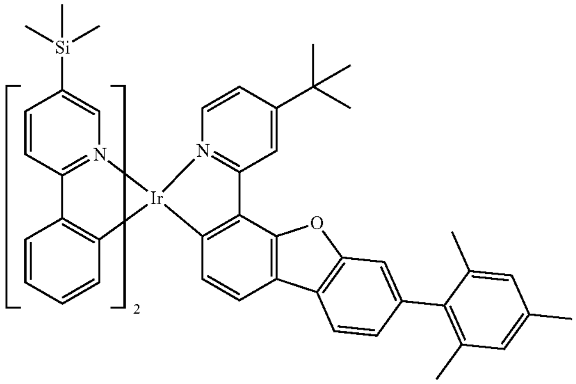

425
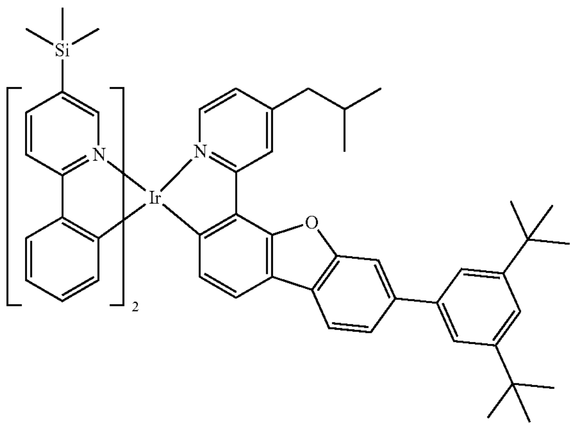
426
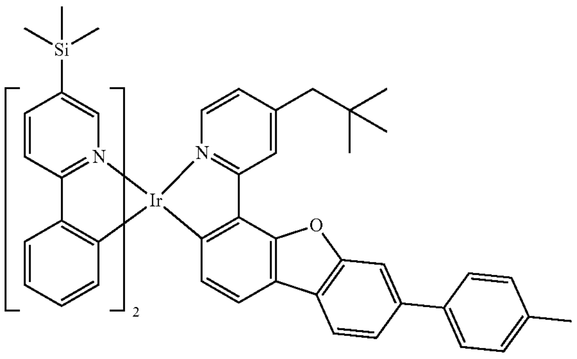
427
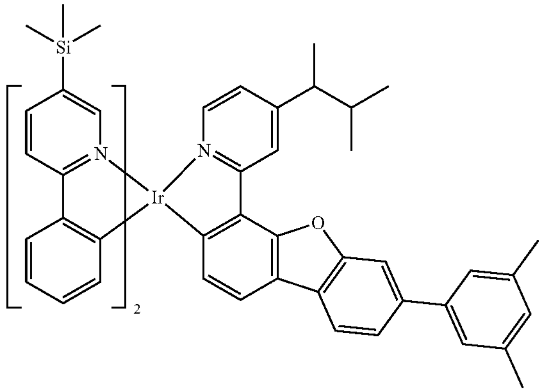
428
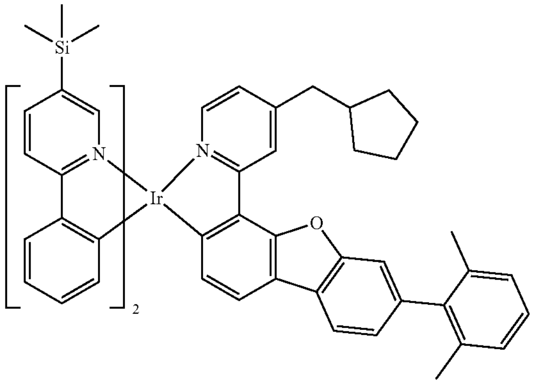
429
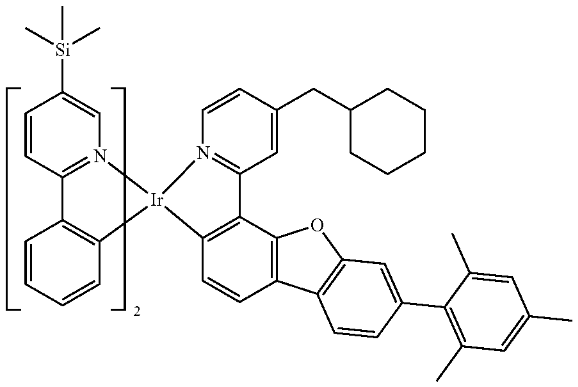
430
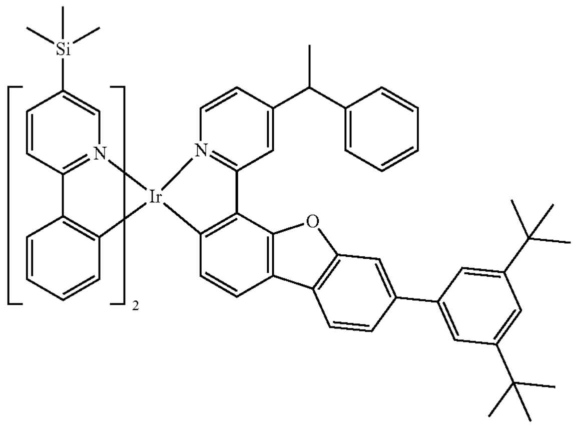
431
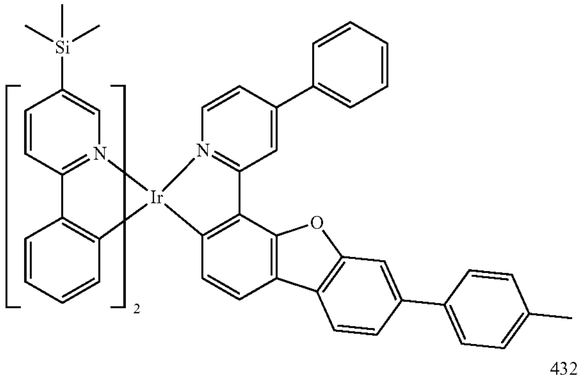
432
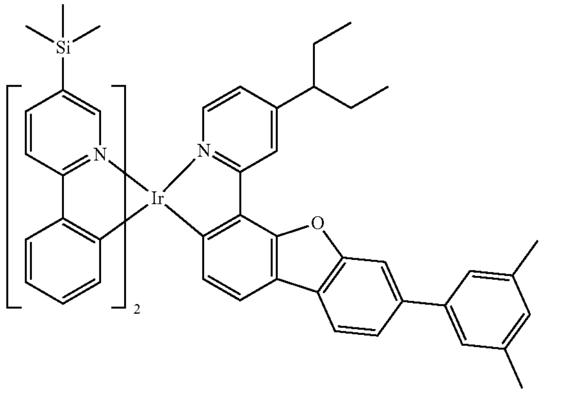

-continued
433
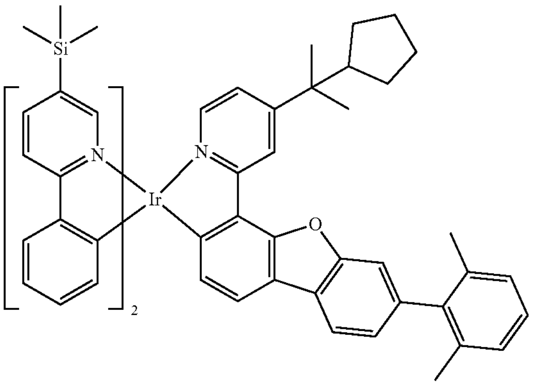
434
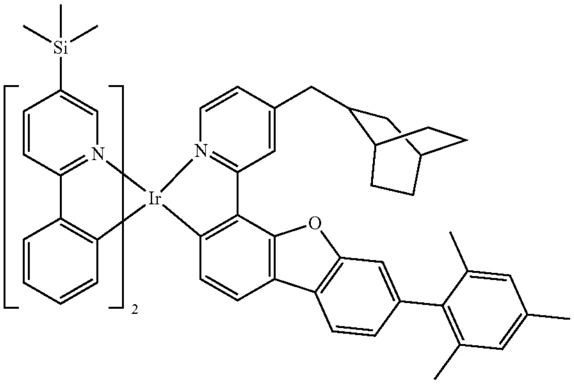
435
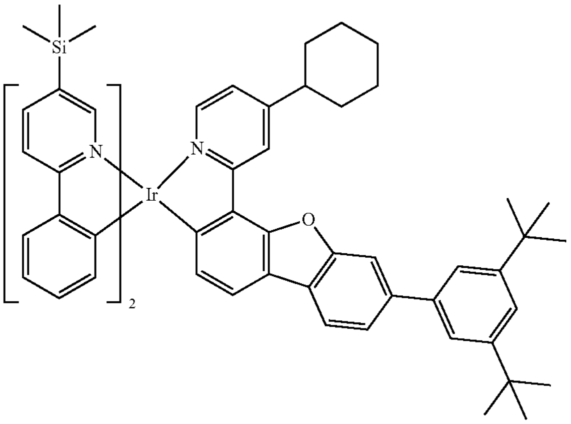
436
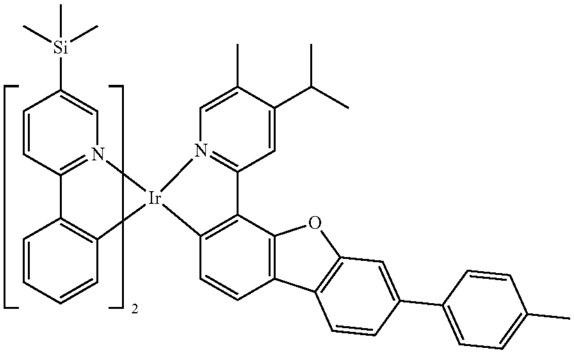
-continued
437
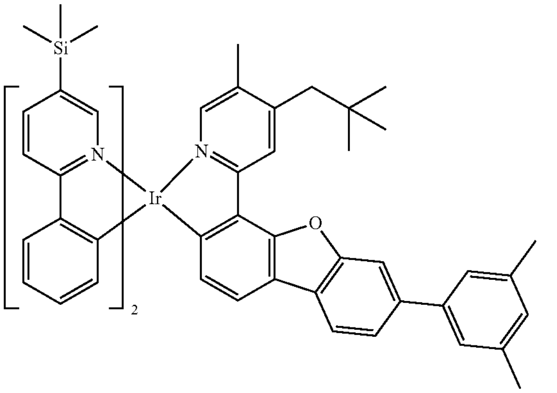
438
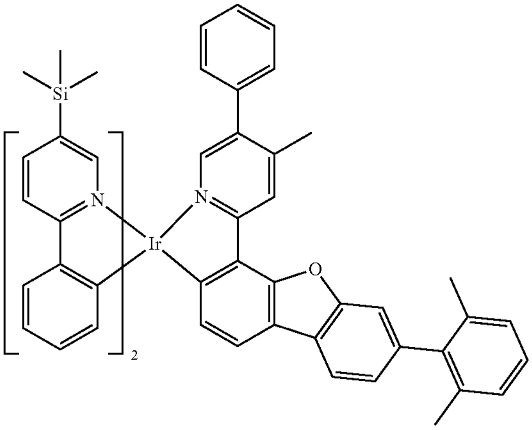
439
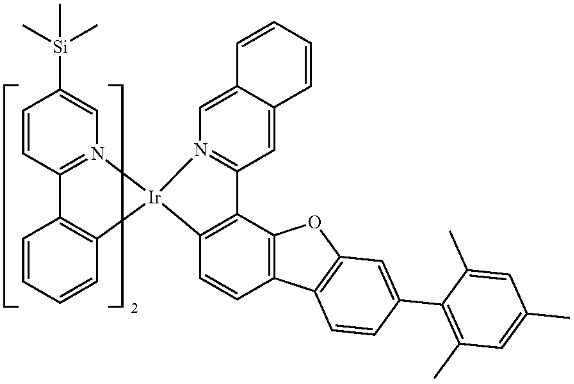

-continued
440
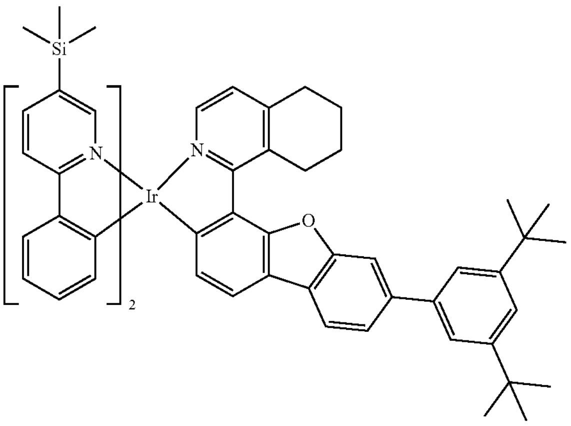
441
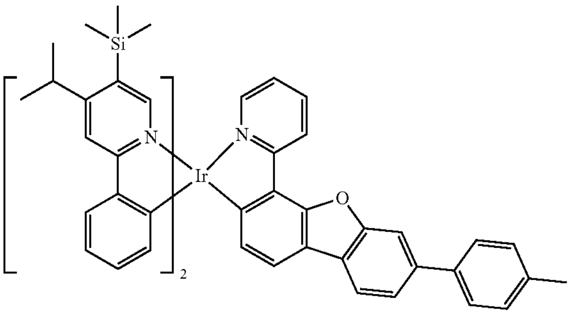
442
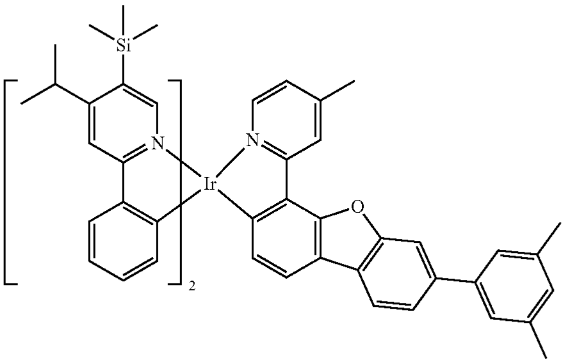
443
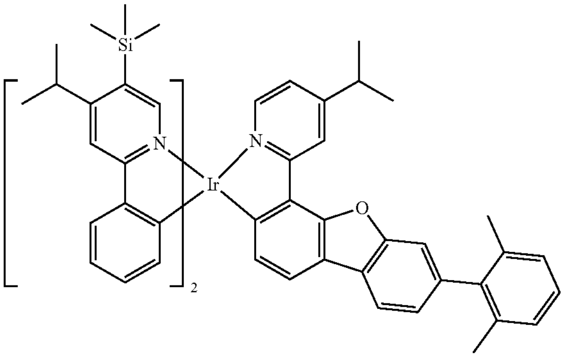
-continued
444
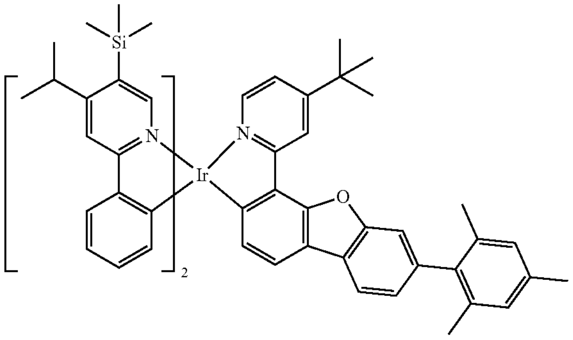
445
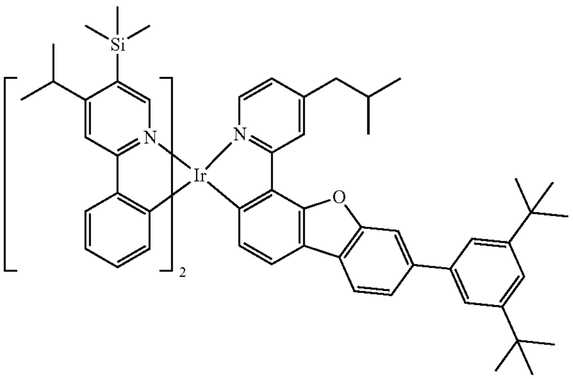
446
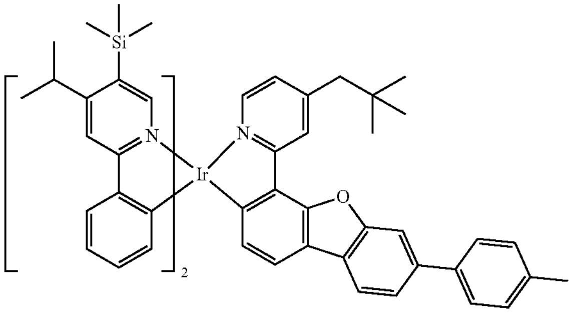
447
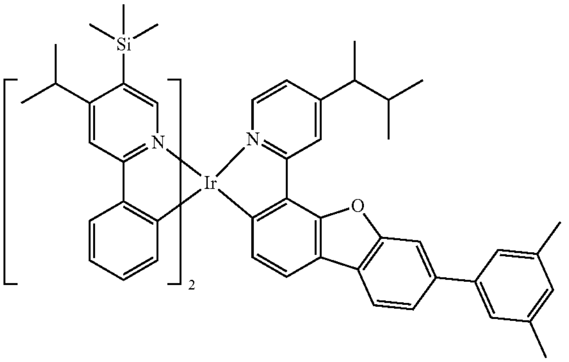

-continued
448
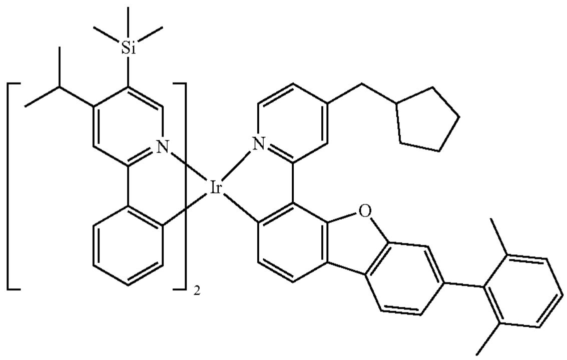
449
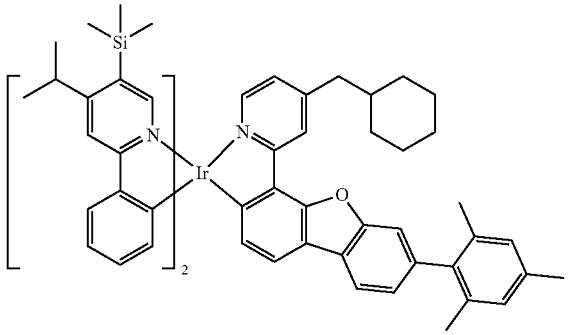
450
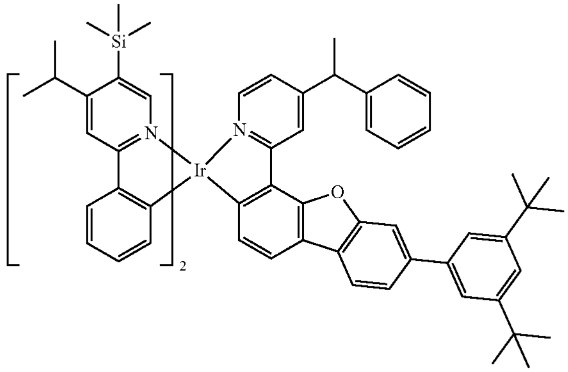
451
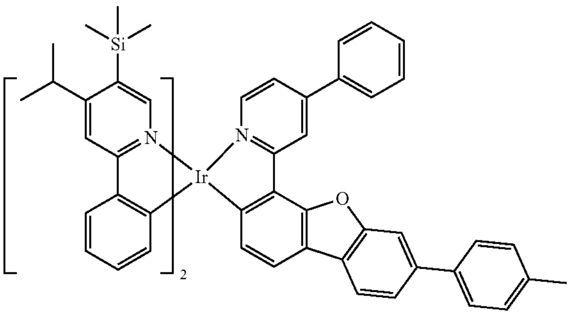
-continued
452
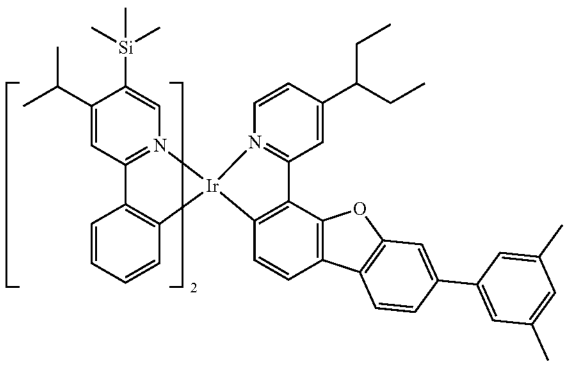
453
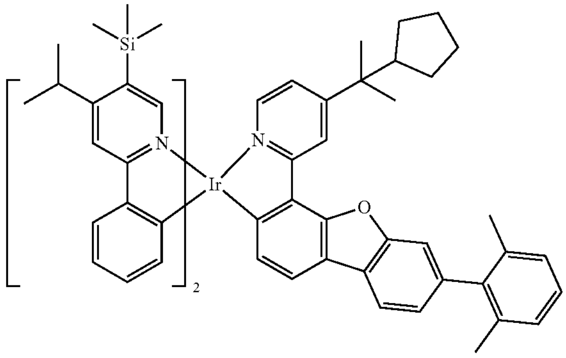
454
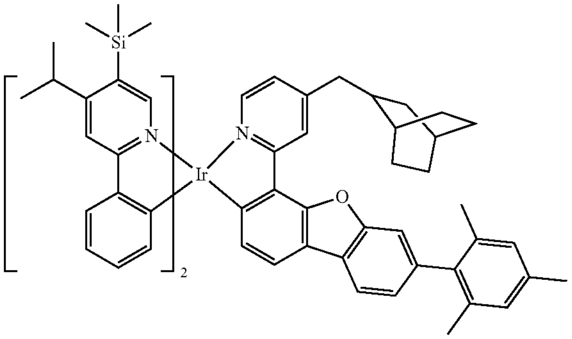
455
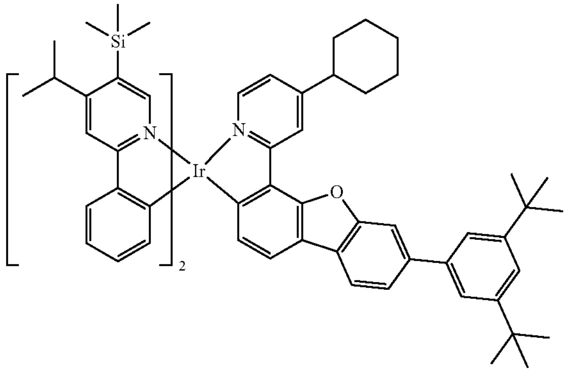

-continued
456
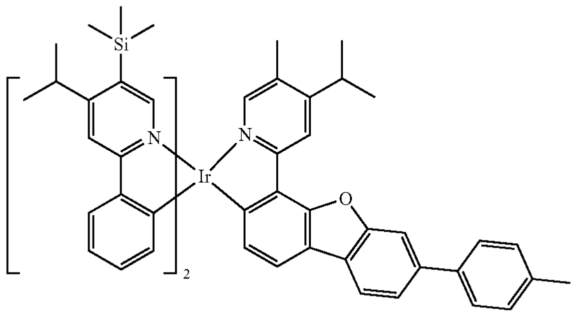
457
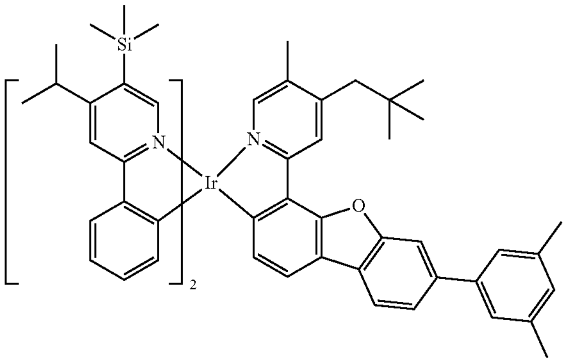
458
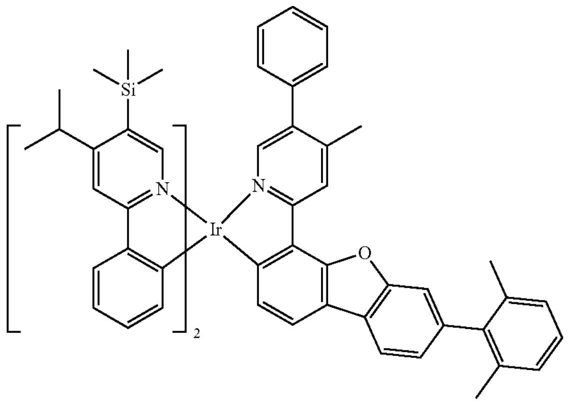
459
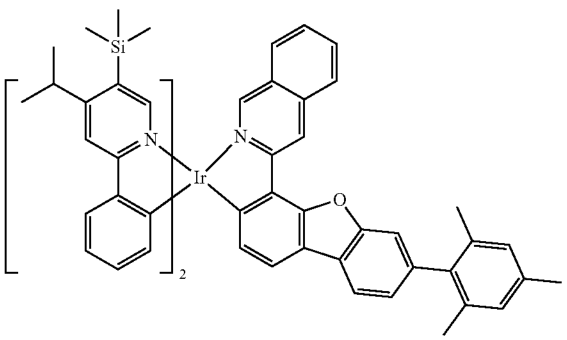
-continued
460
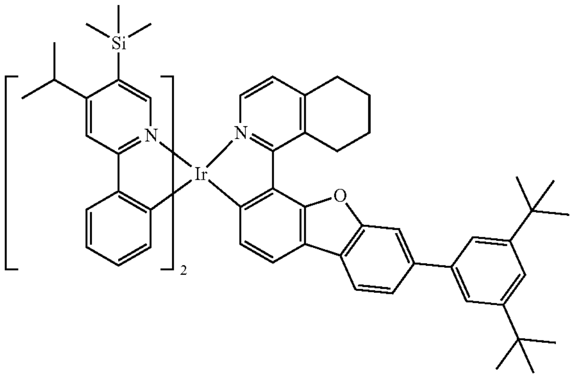
461
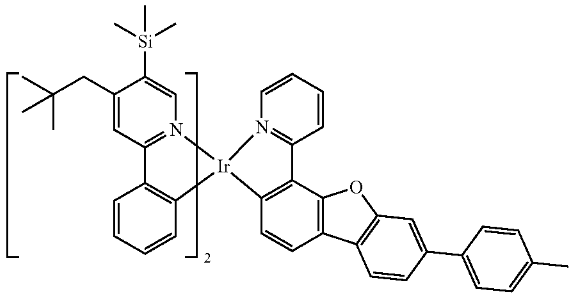
462
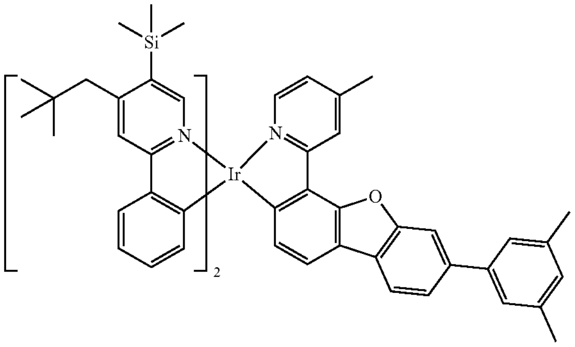
463
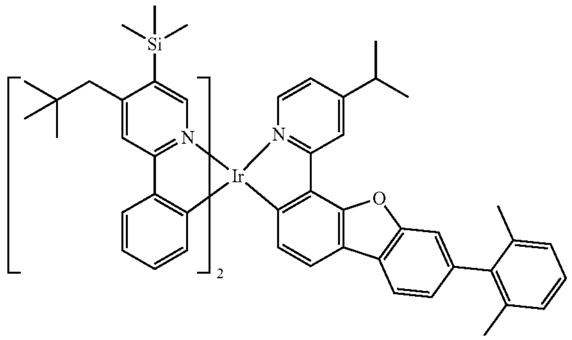

-continued
464
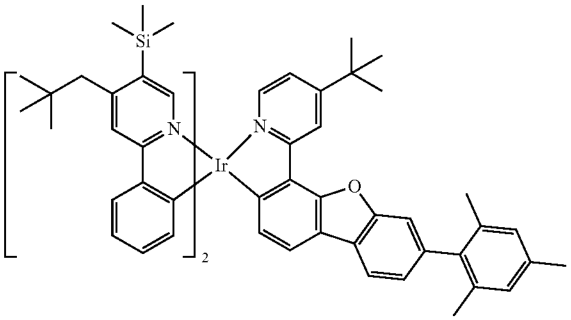
465
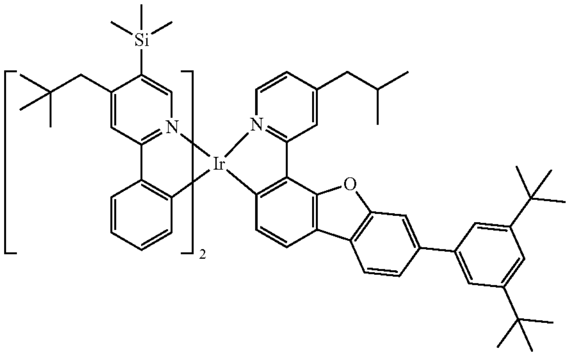
466
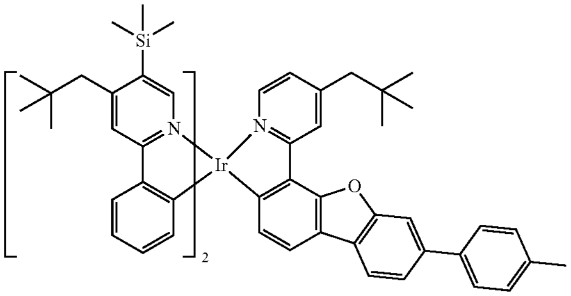
467
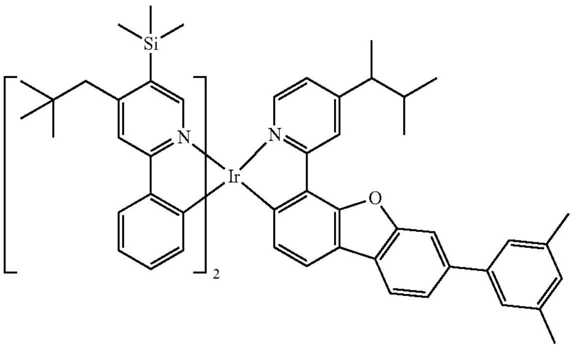
-continued
468
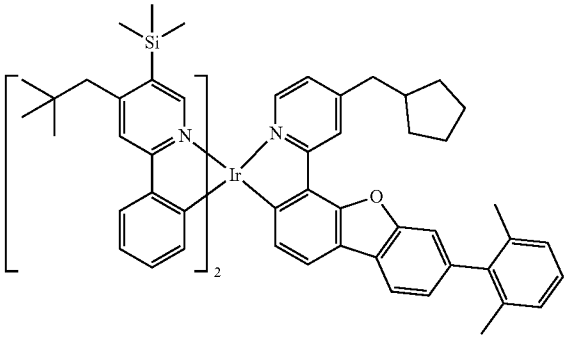
469
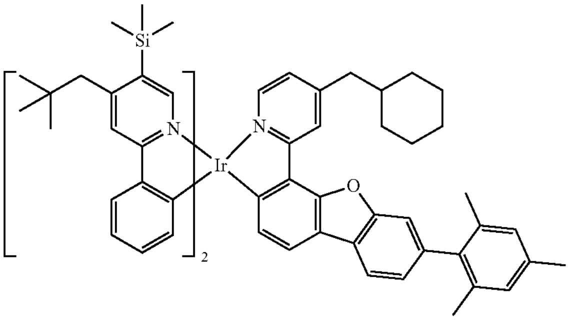
470
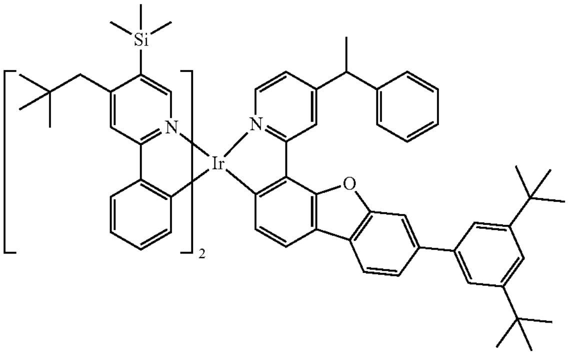
471
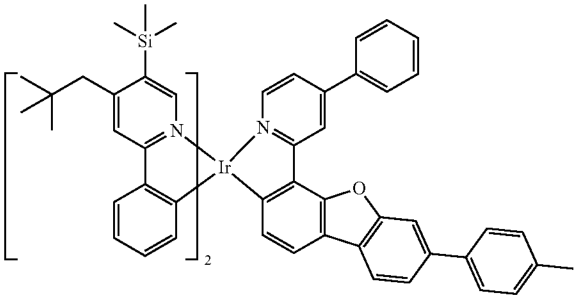

-continued
472
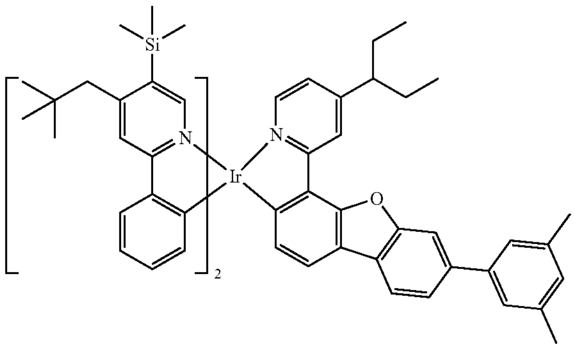
473
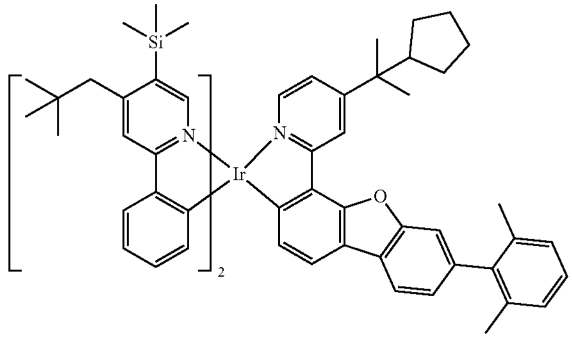
474
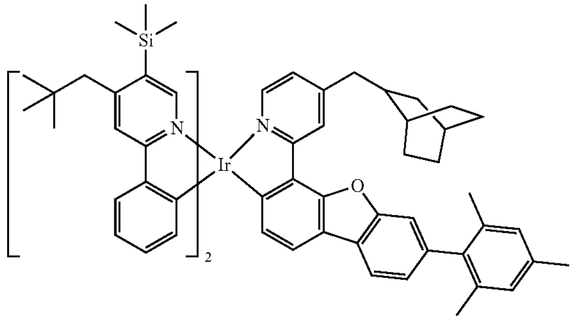
475
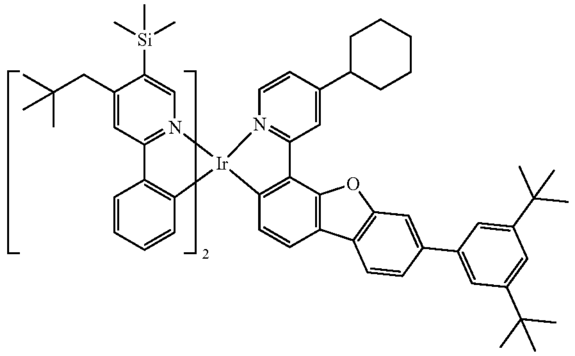
-continued
476
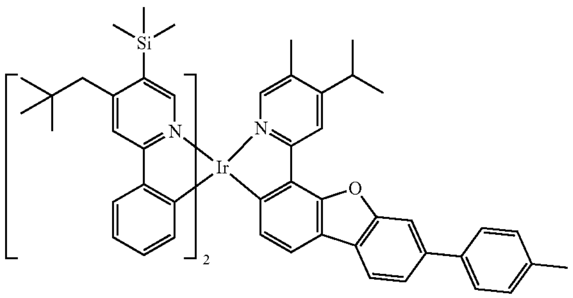
477
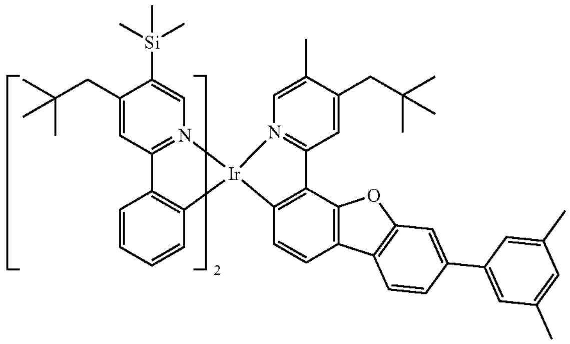
478
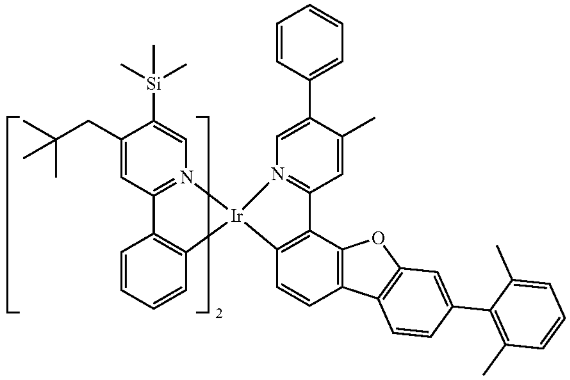
479
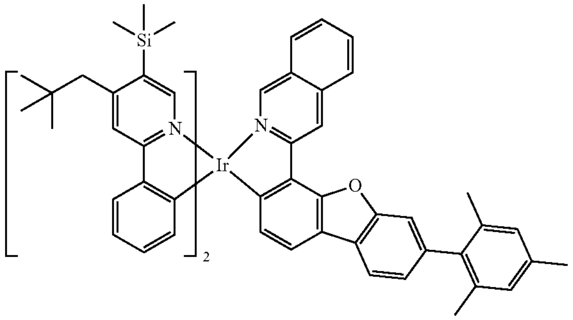

-continued
-continued
480
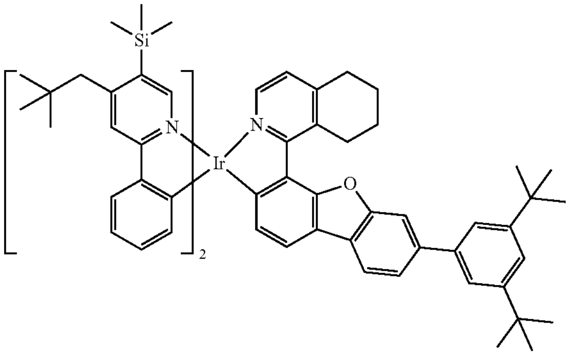
481
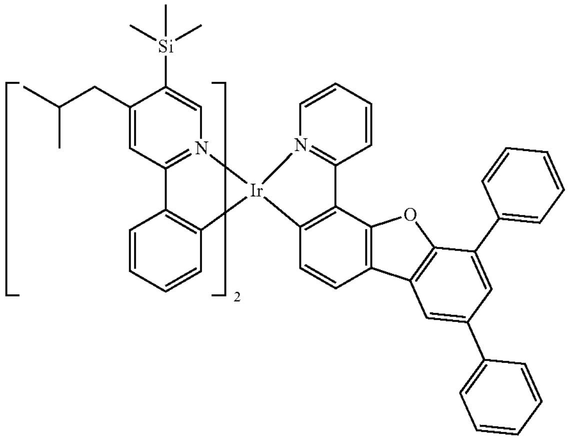
482
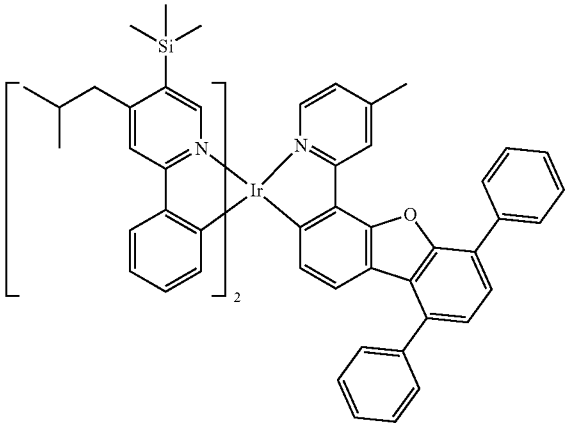
483
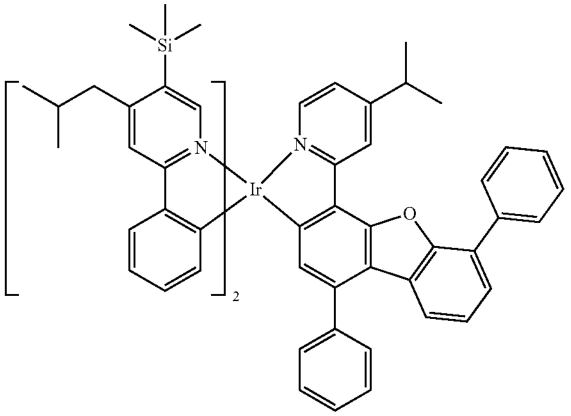
484
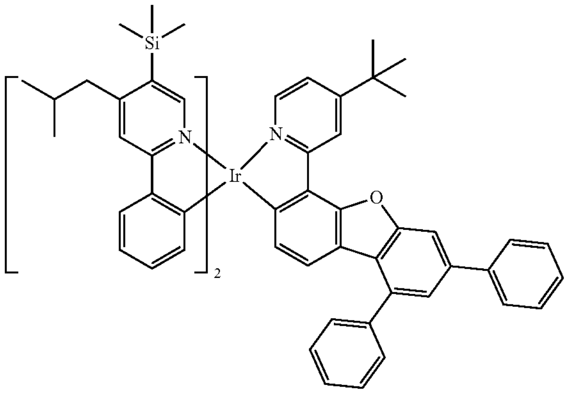
485
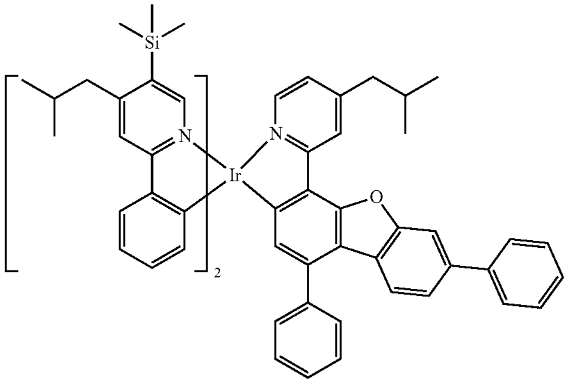

-continued
486
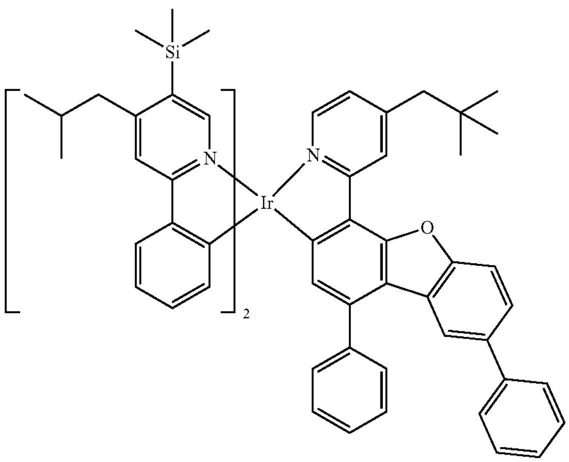
487
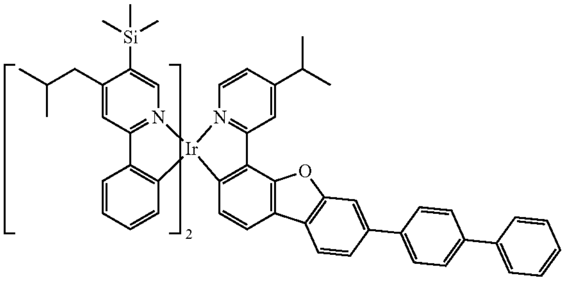
488
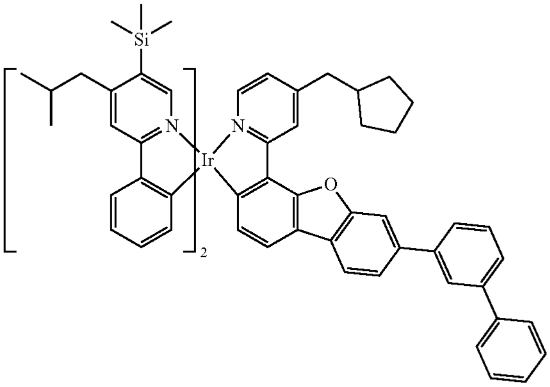
-continued
489
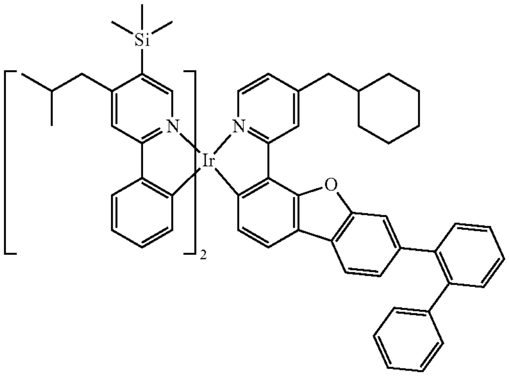
490
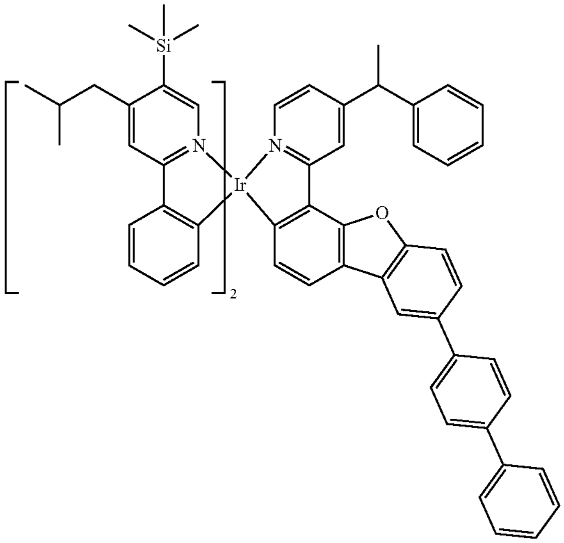
491
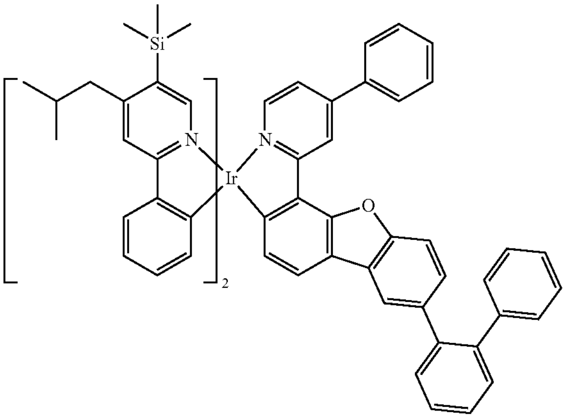

-continued
492
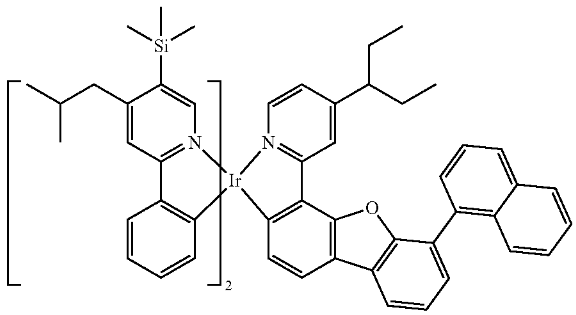
493
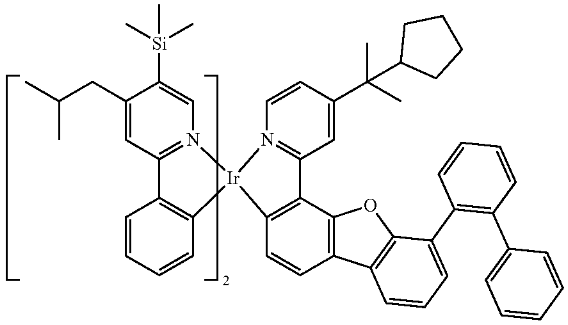
494
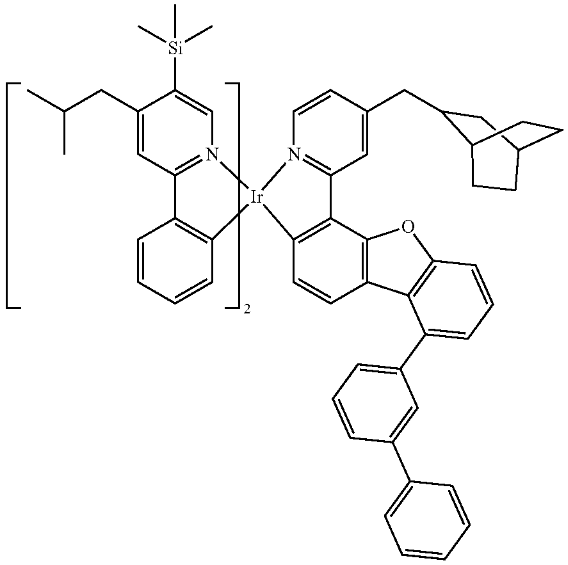
-continued
495
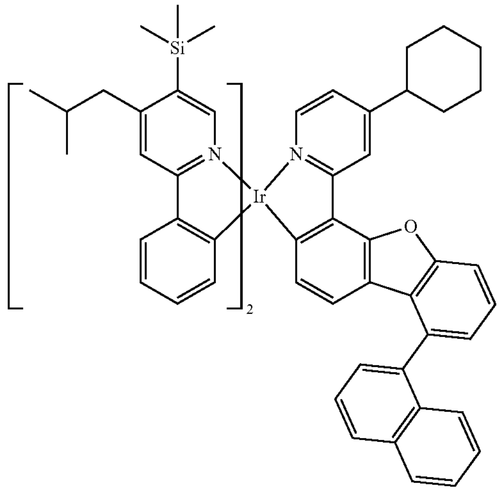
496
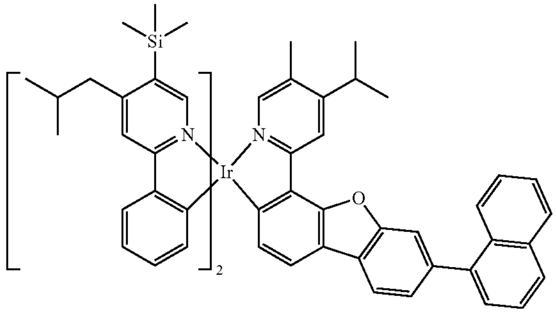
497
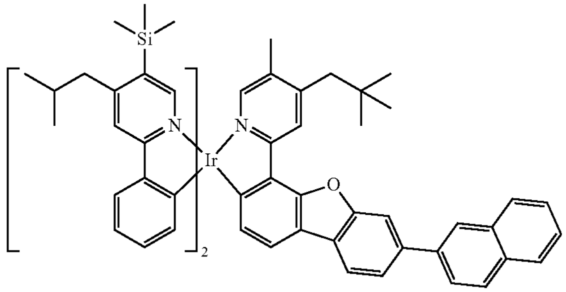
498
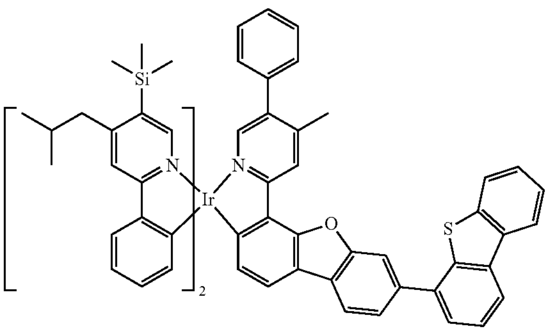

-continued
499
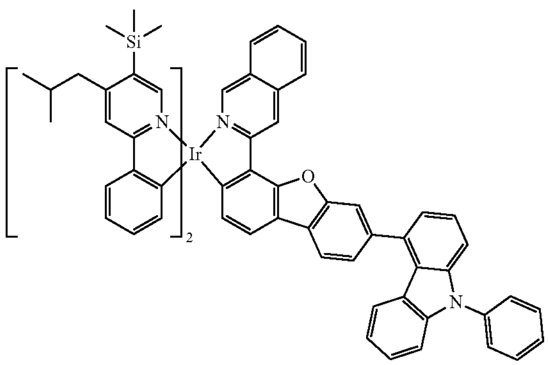
500
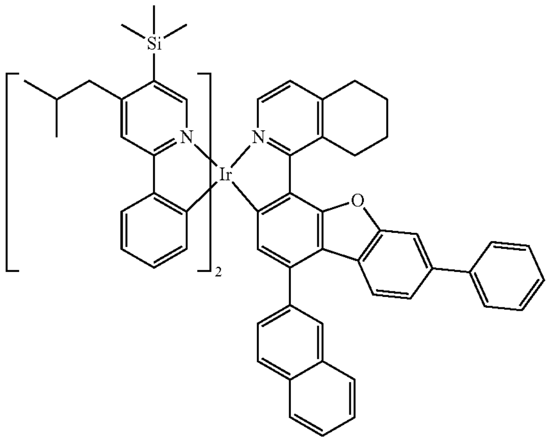
501
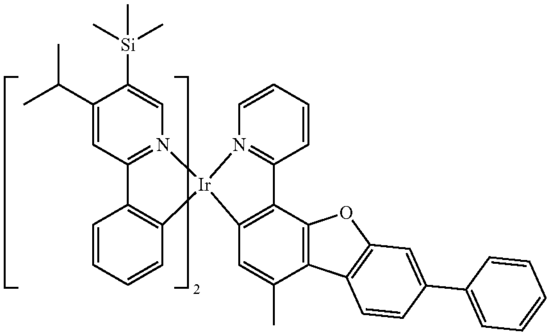
502
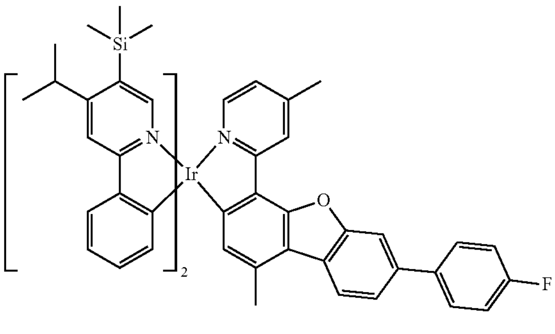
-continued
503
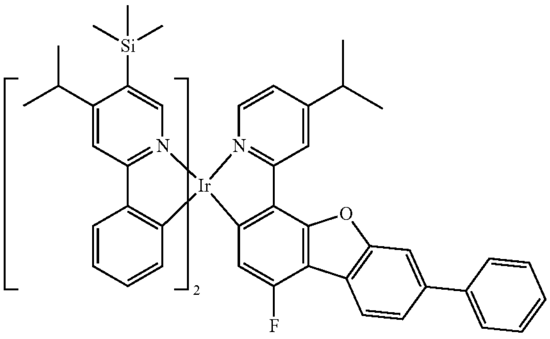
504
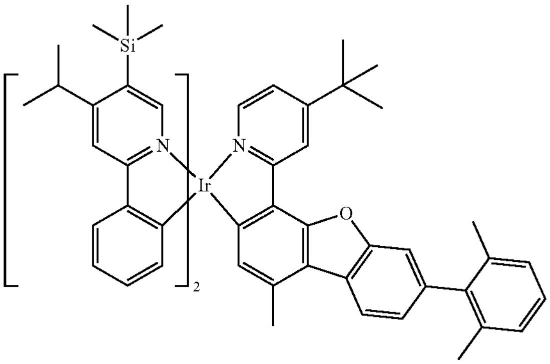
505
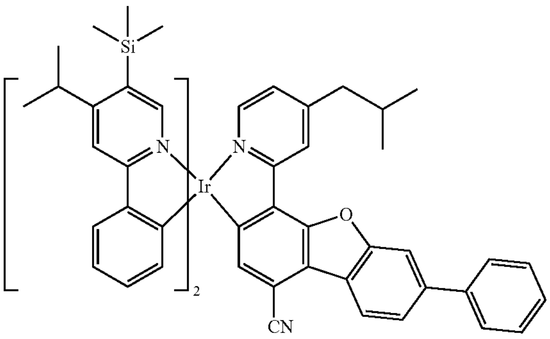
506
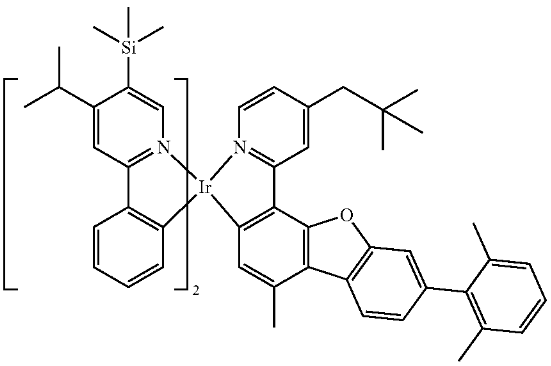

-continued
507
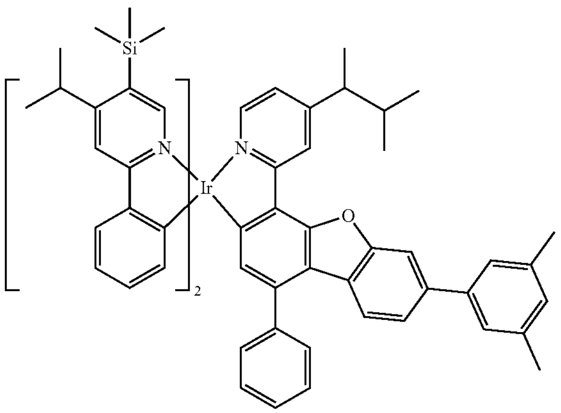
508
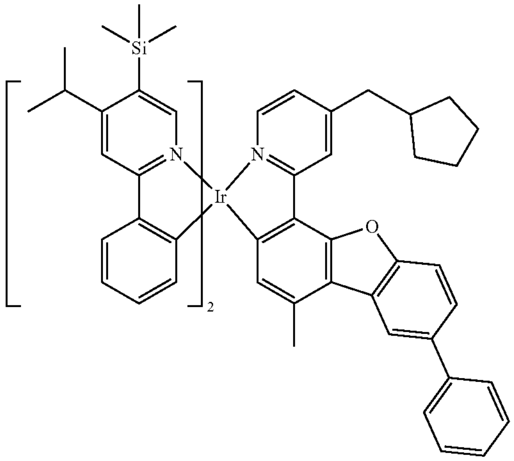
509
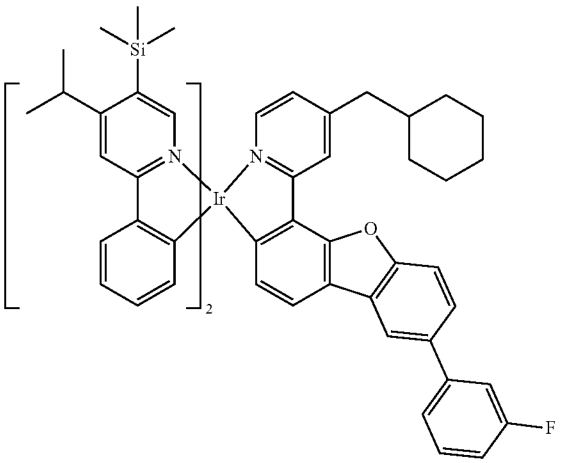
-continued
510
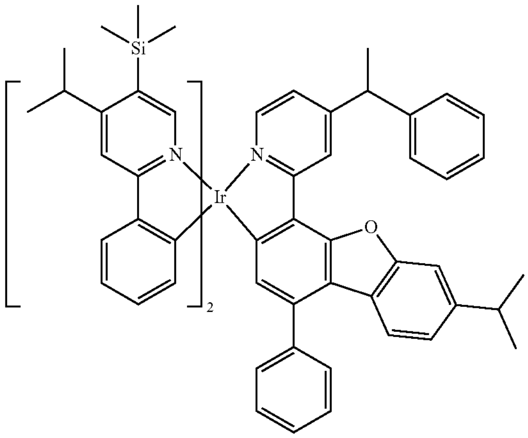
511
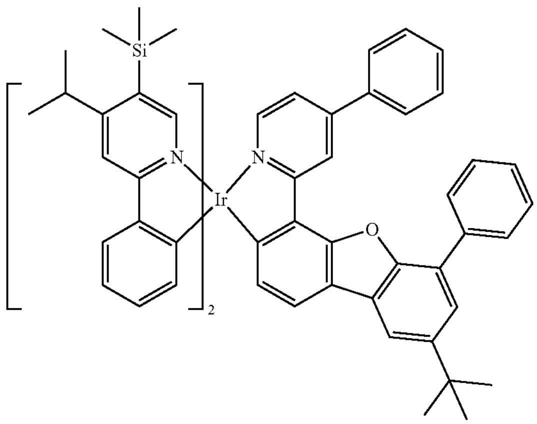
512
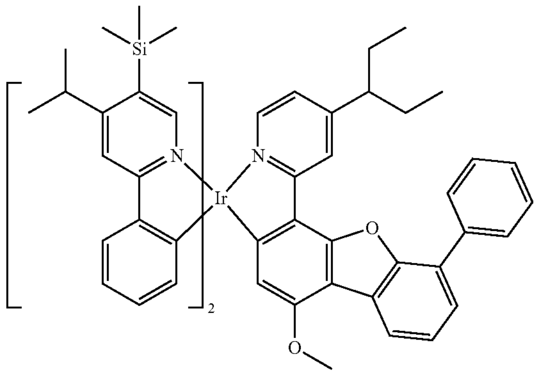

513
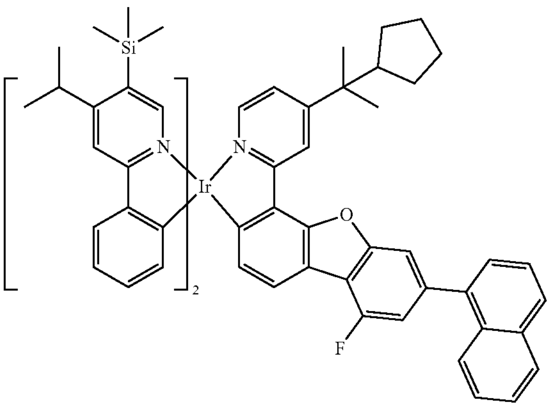
514
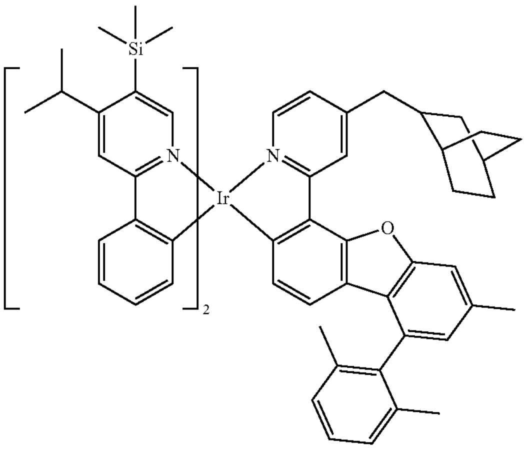
515
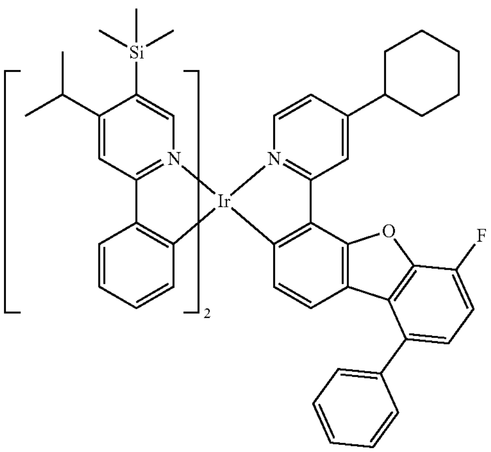
516
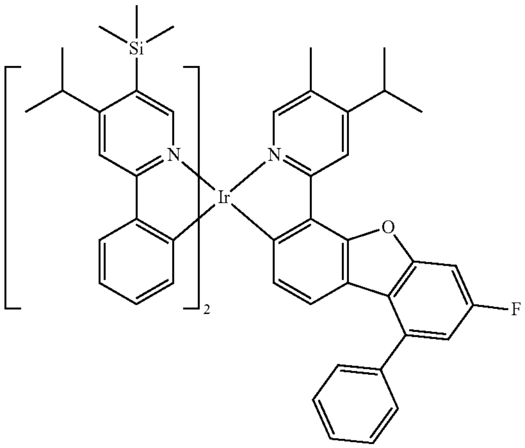
517
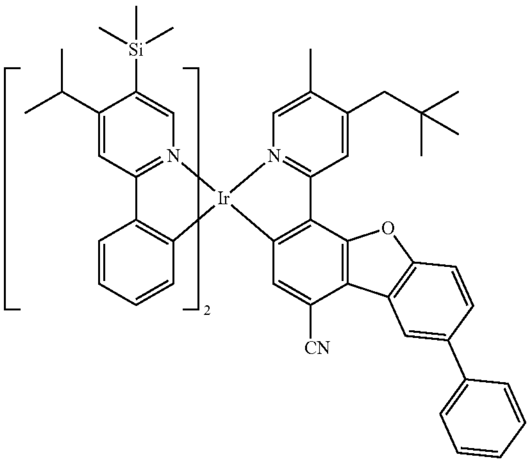
518
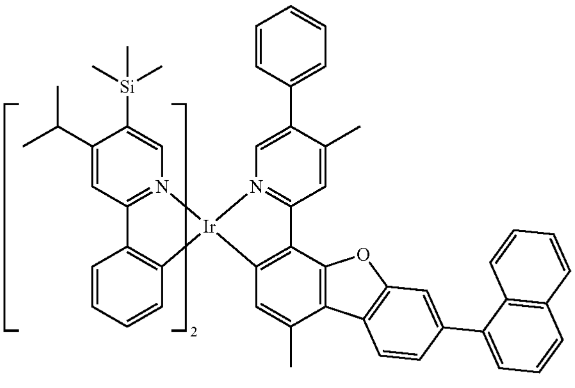

-continued
519
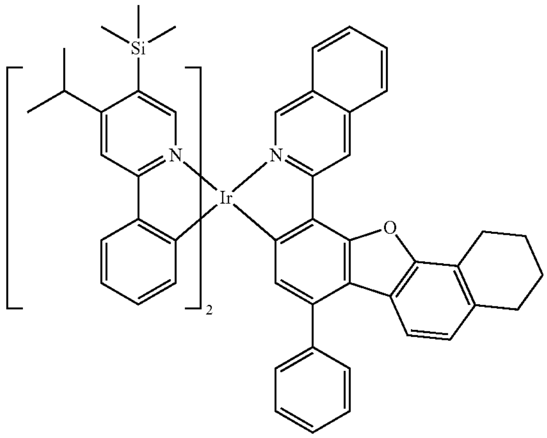
520
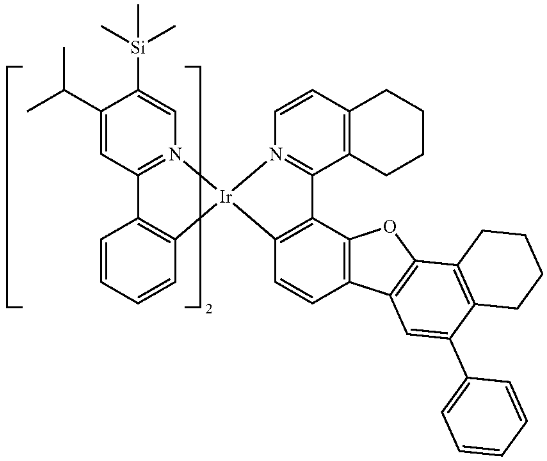
521
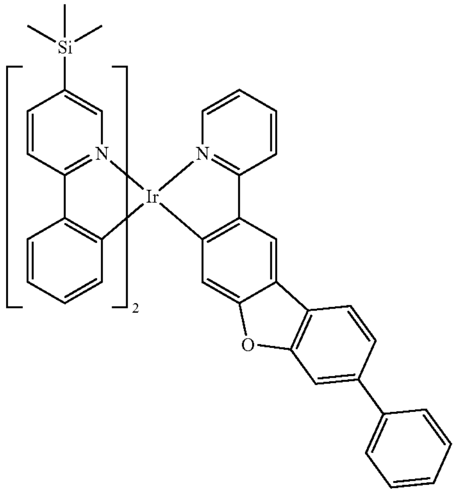
-continued
522
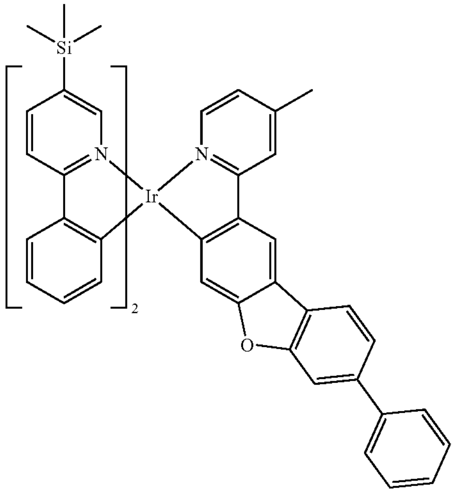
523
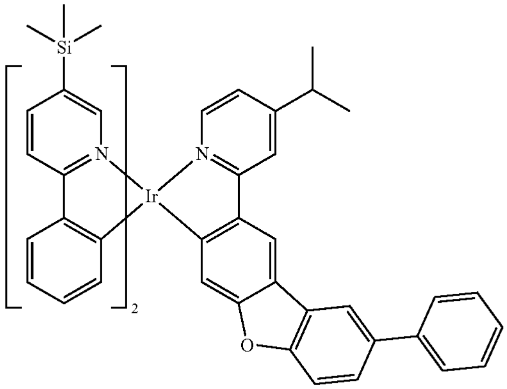
524
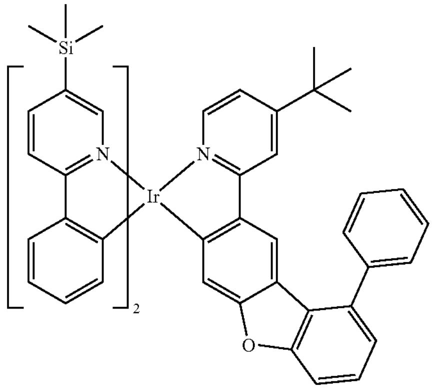

-continued
525
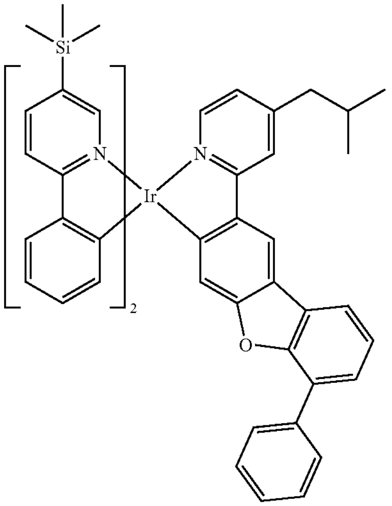
526
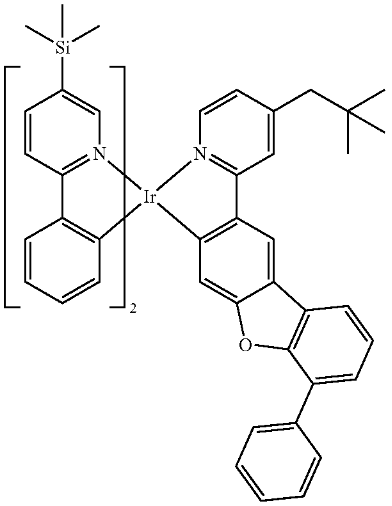
527
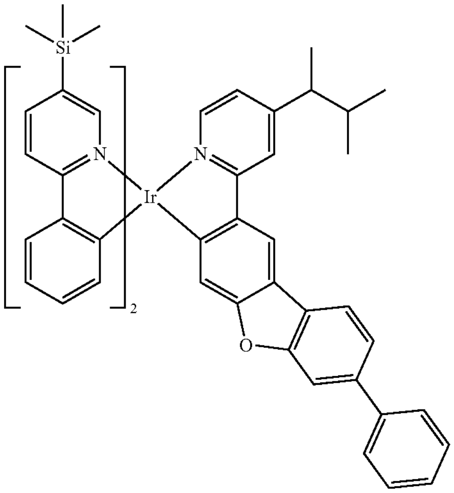
528
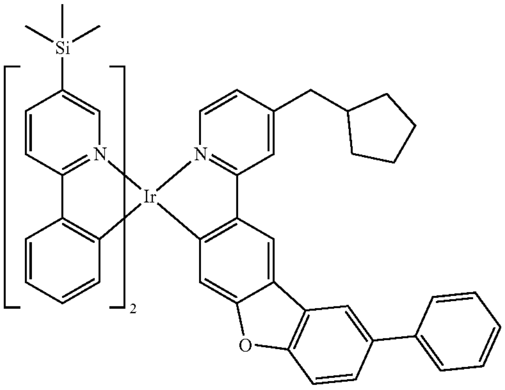
529
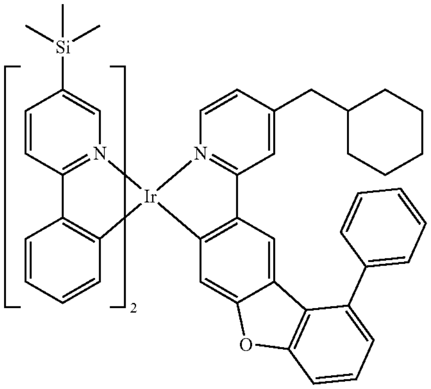
530
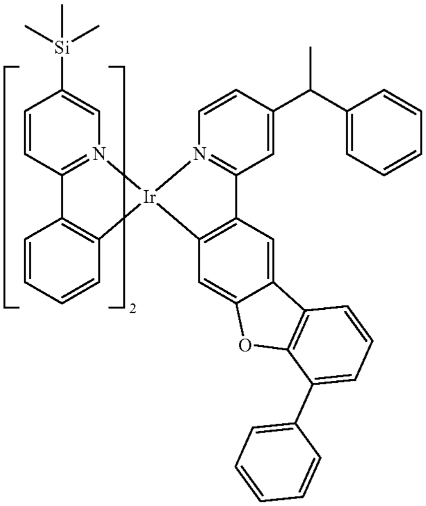

-continued
531
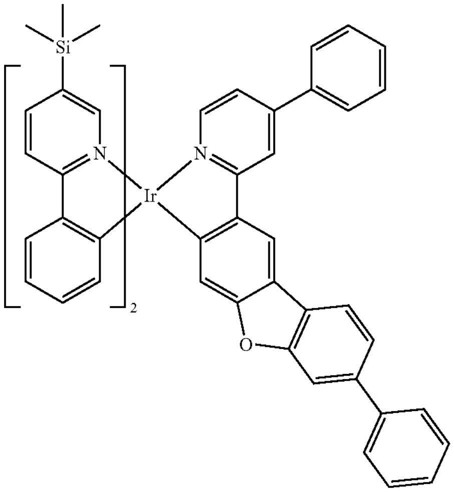
532
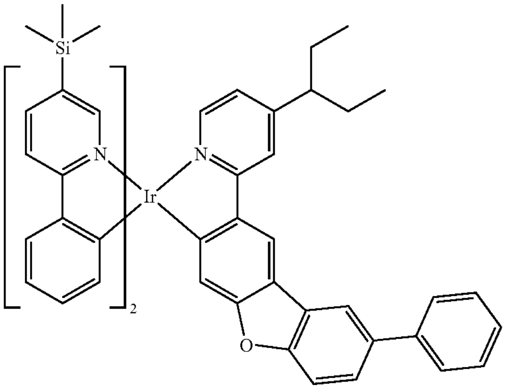
533
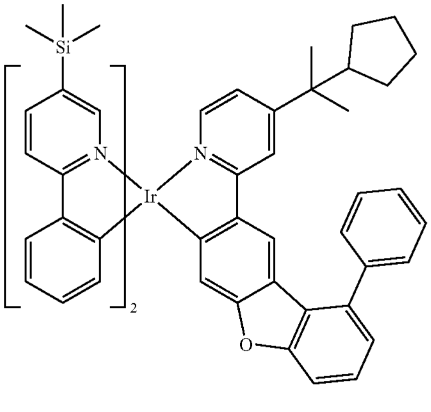
-continued
534
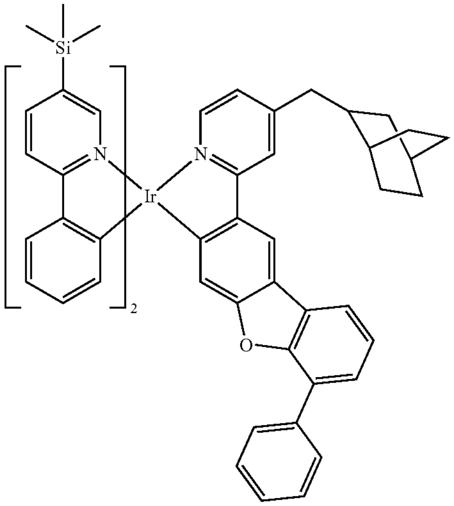
535
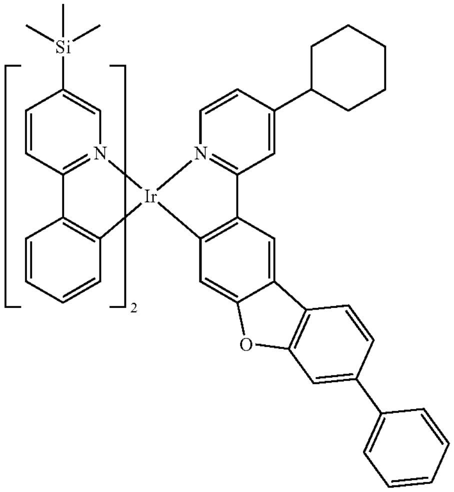
536
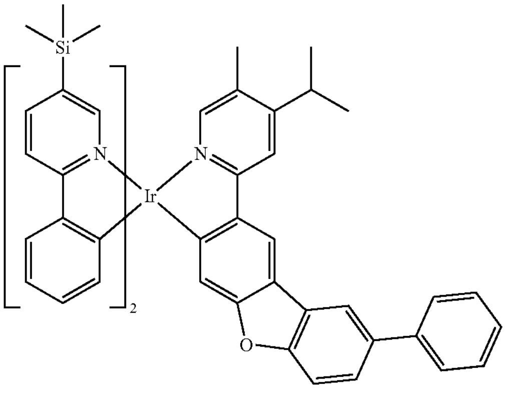

-continued
537
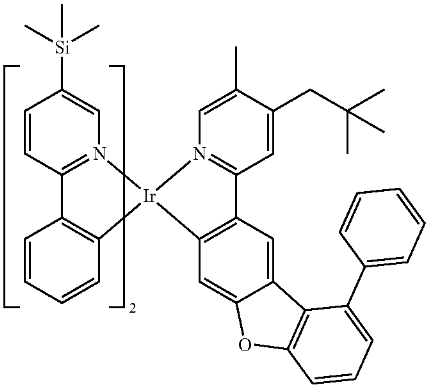
538
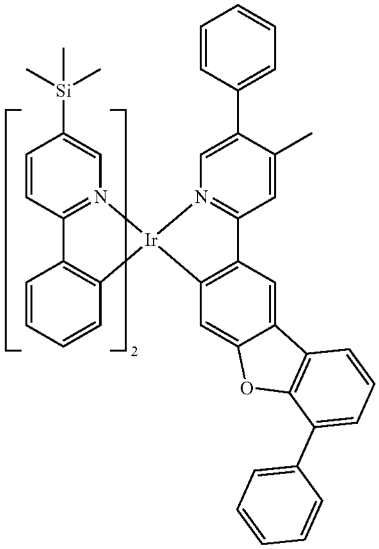
539
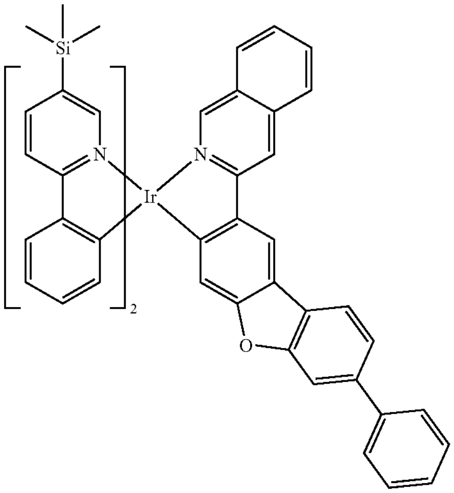
-continued
540
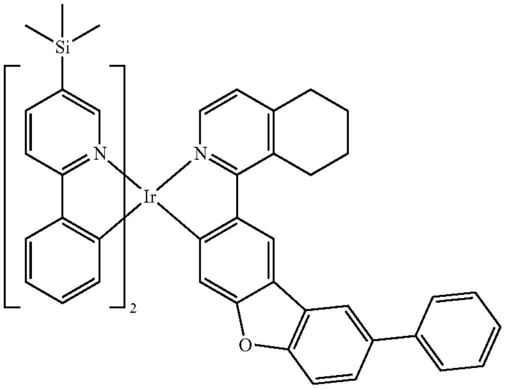
541
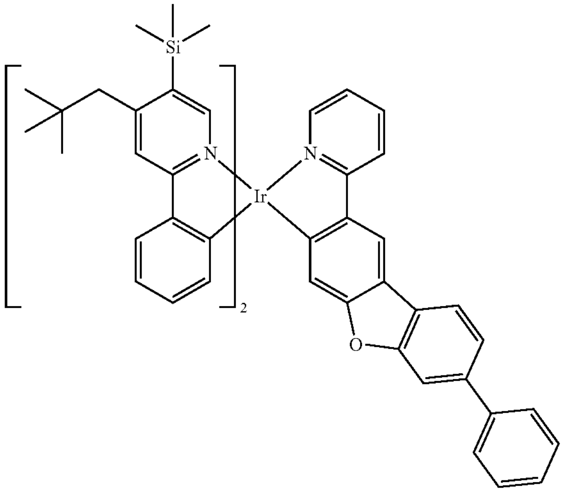
542
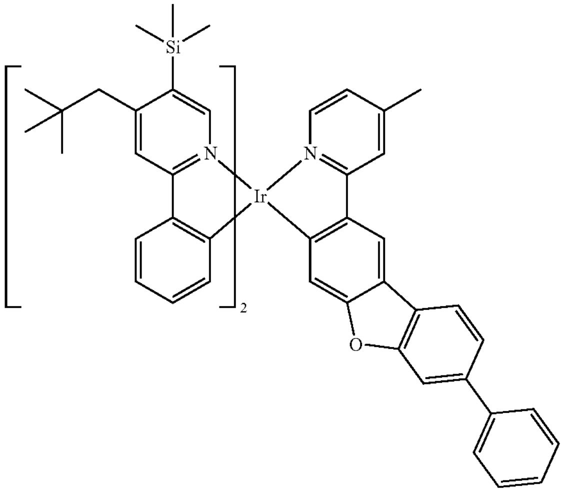

-continued
543
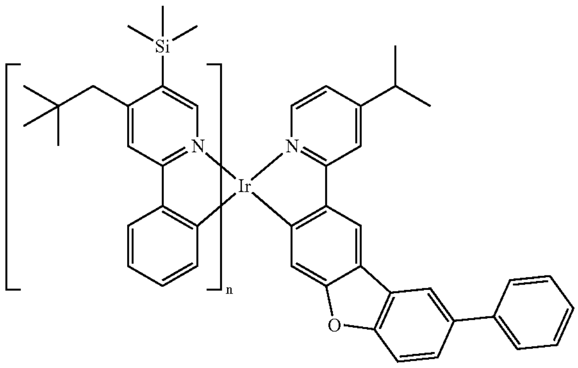
544
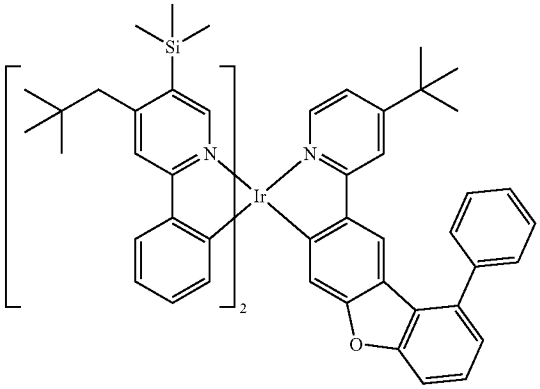
545
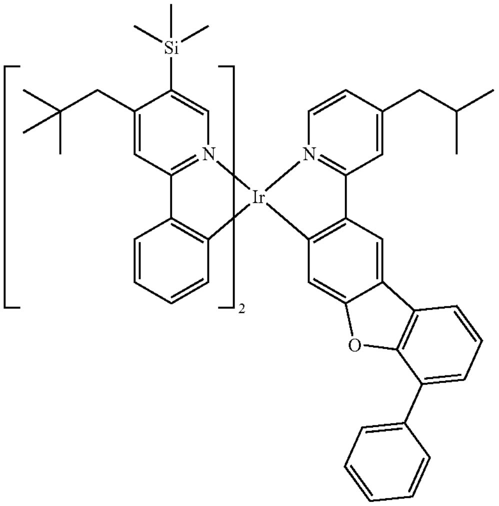
-continued
546
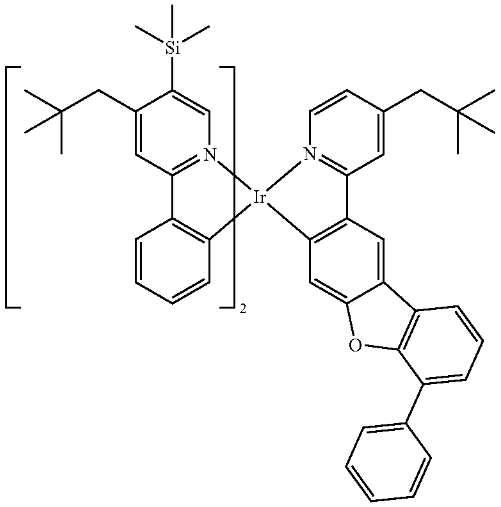
547
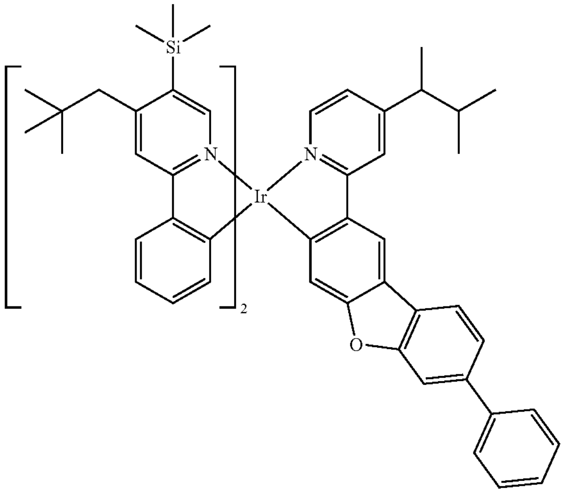
548
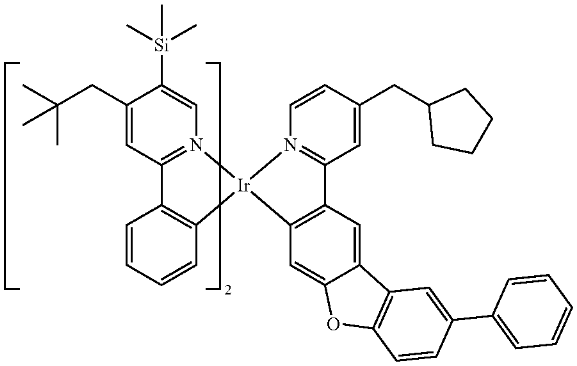

-continued
549
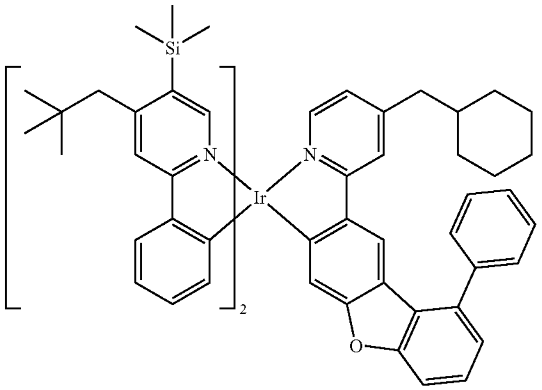
552
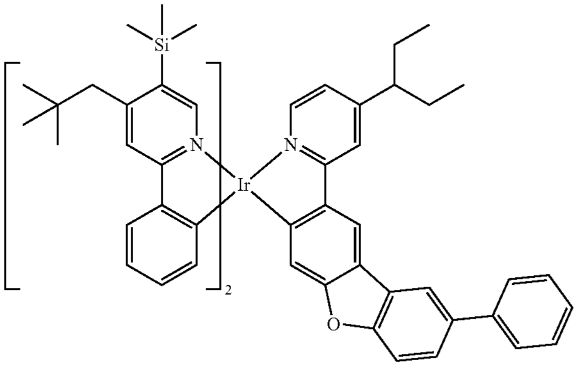
550
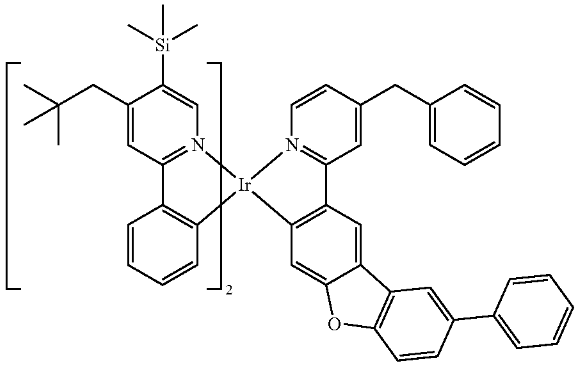
553
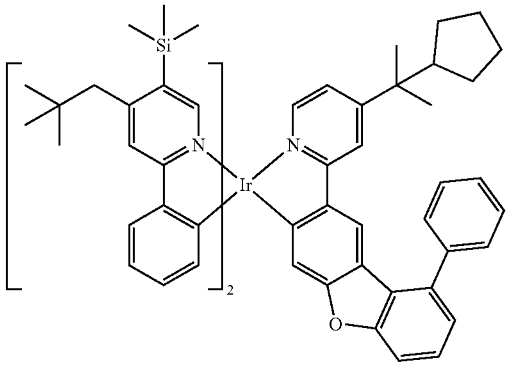
551
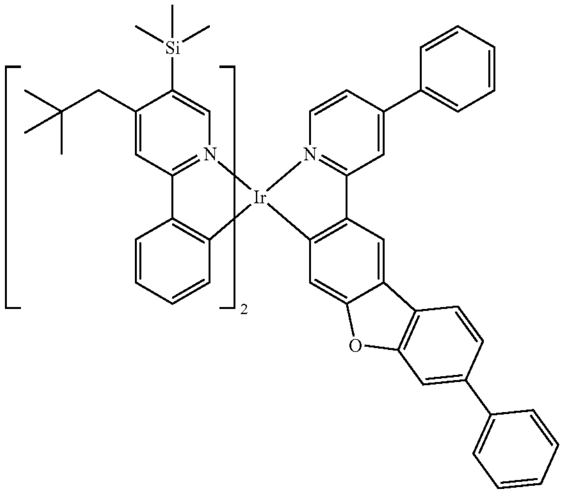
554
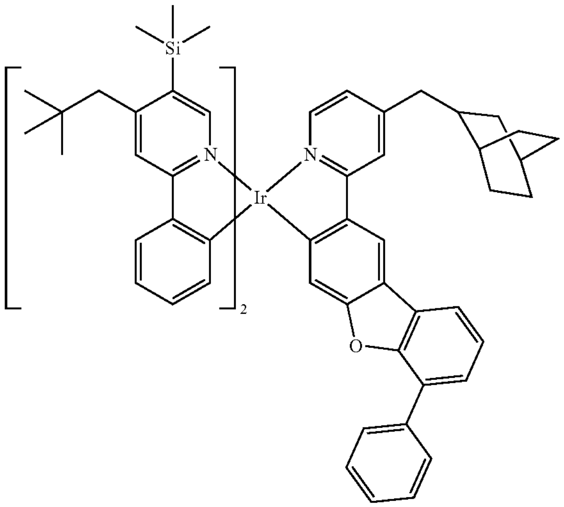

-continued
555
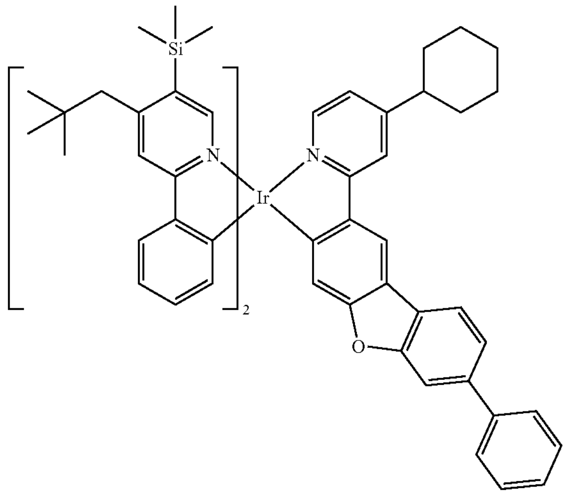
556
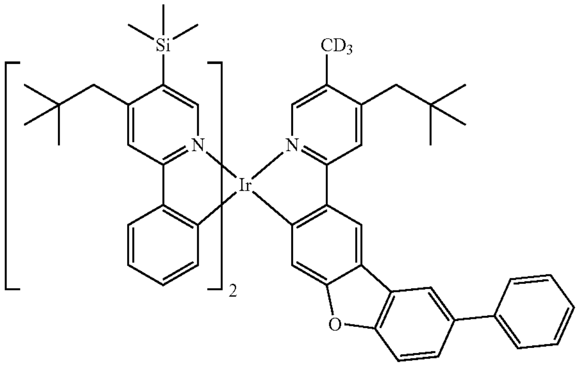
557
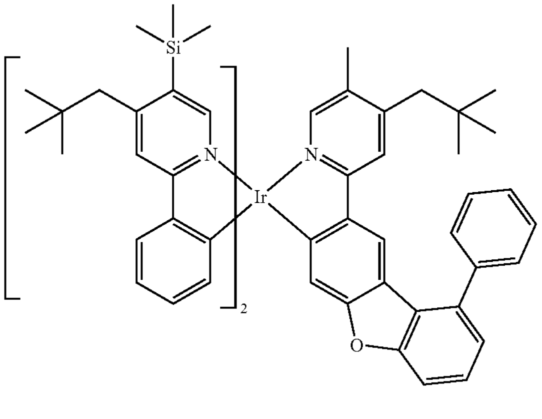
-continued
558
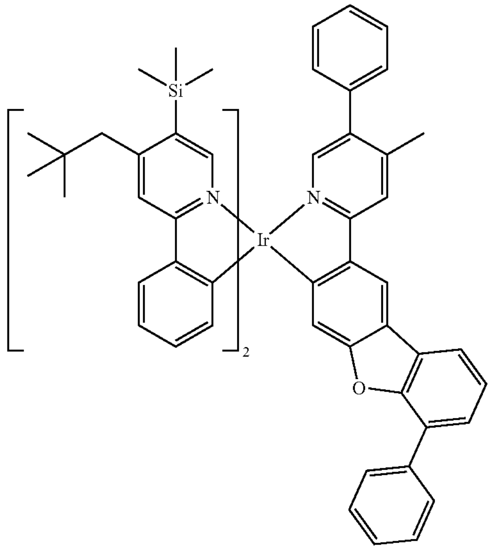
559
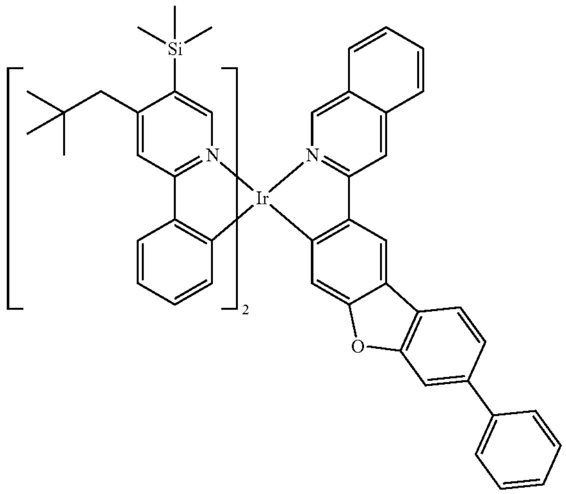
560
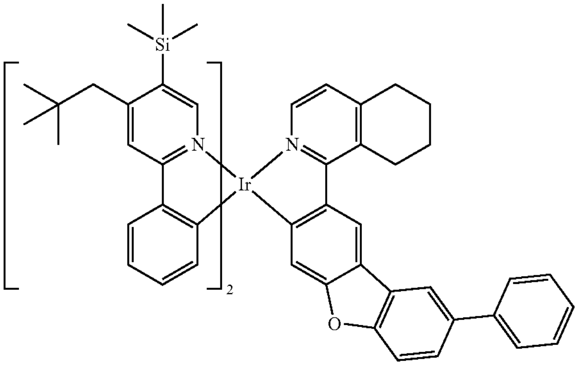

-continued
561
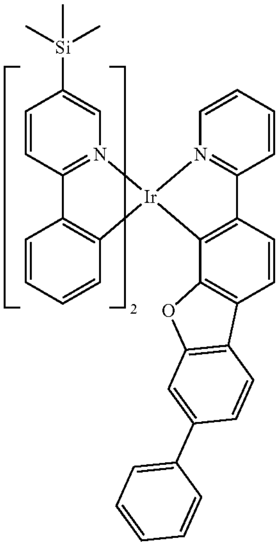
562
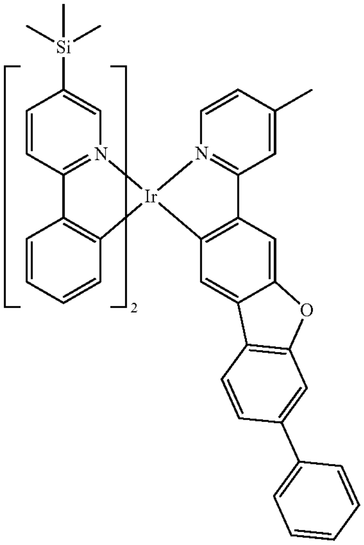
563
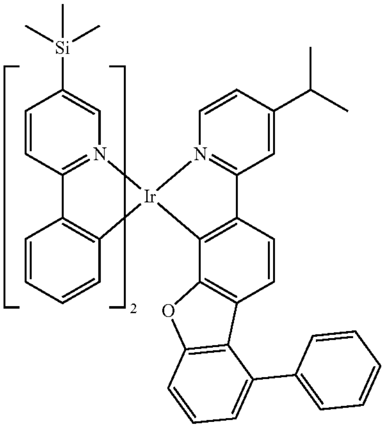
564
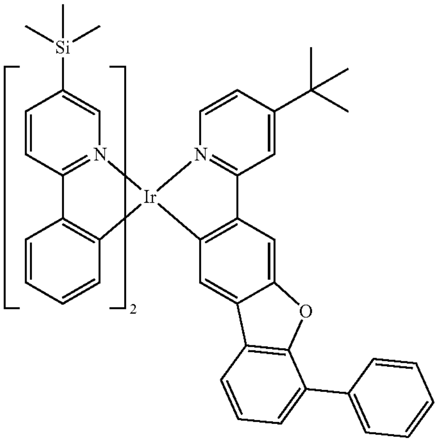
565
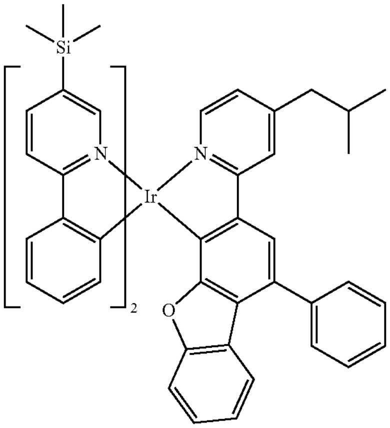
566
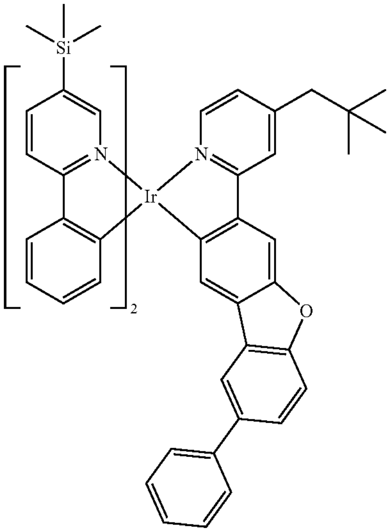

-continued
567
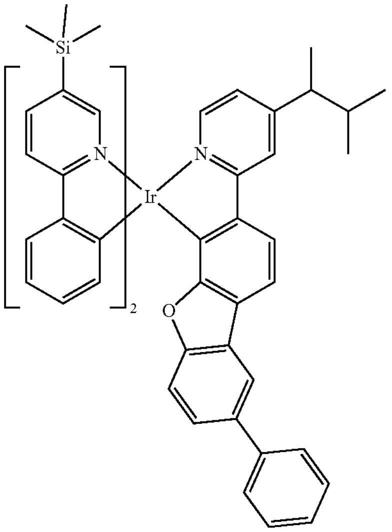
568
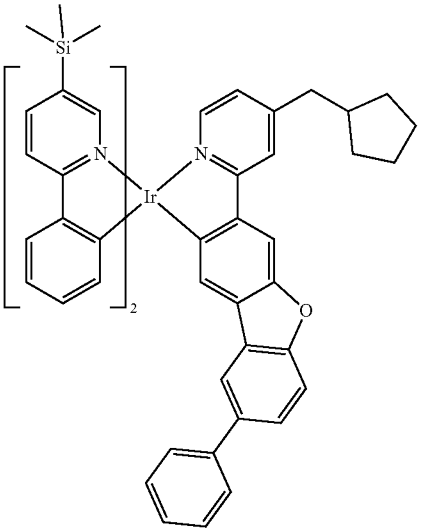
569
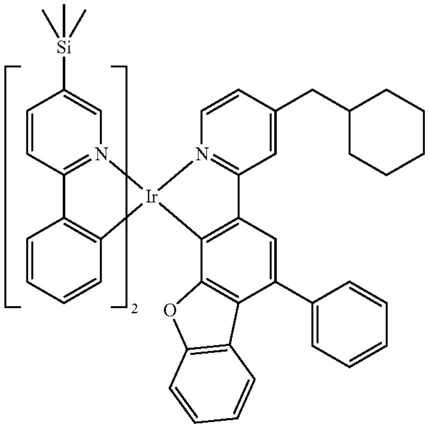
-continued
570
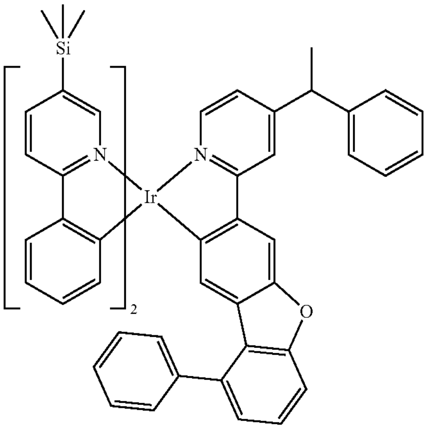
571
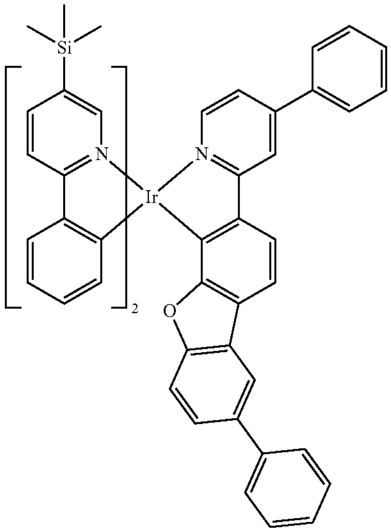
572
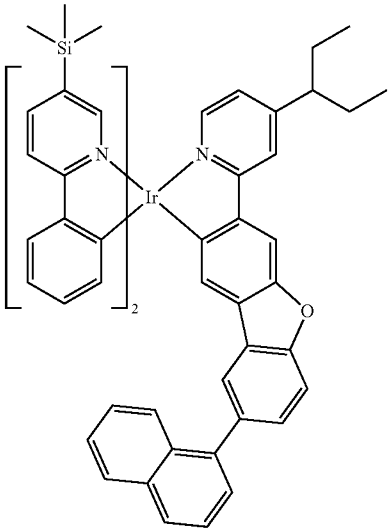

-continued
573
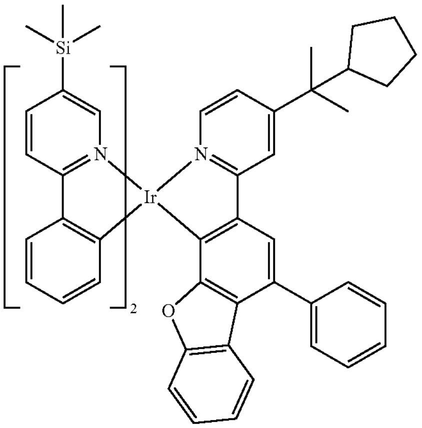
574
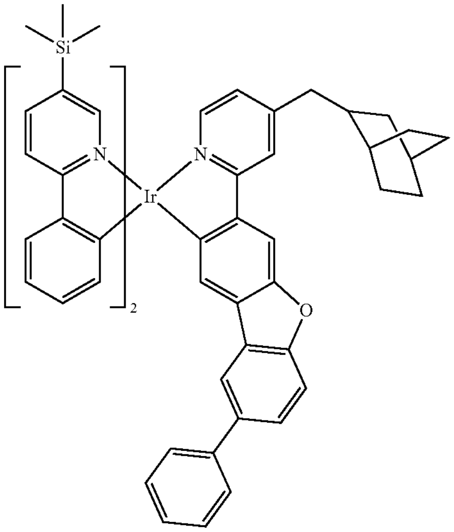
575
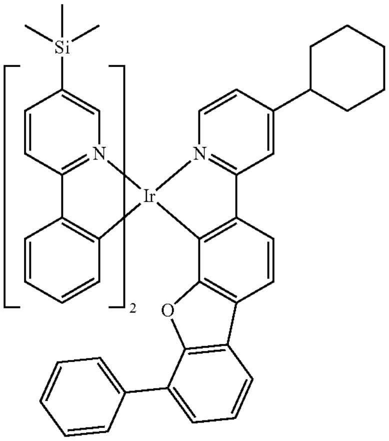
-continued
576
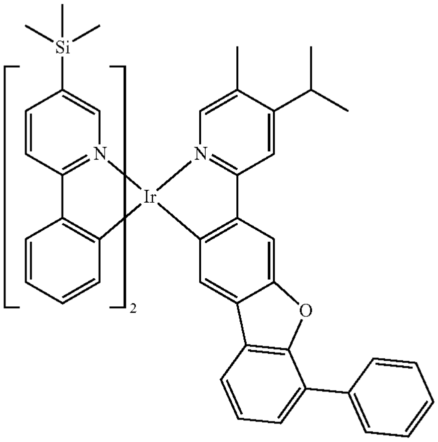
577
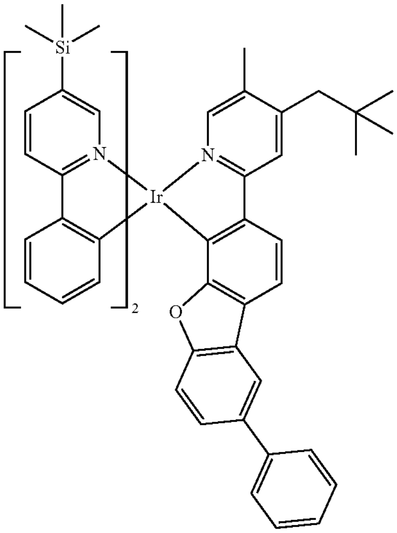
578
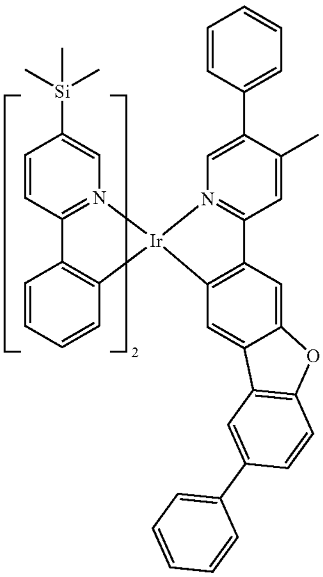

-continued
579
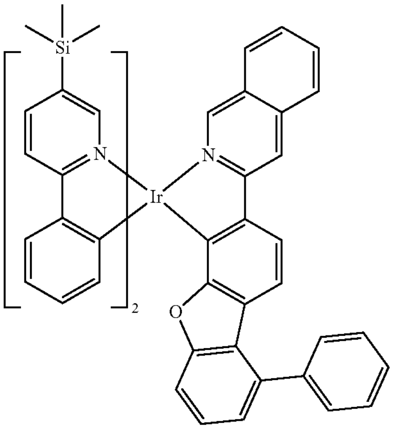
580
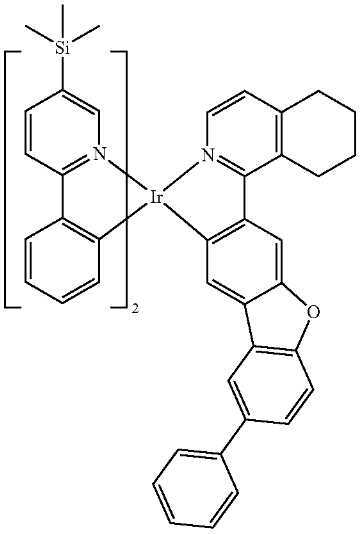
581
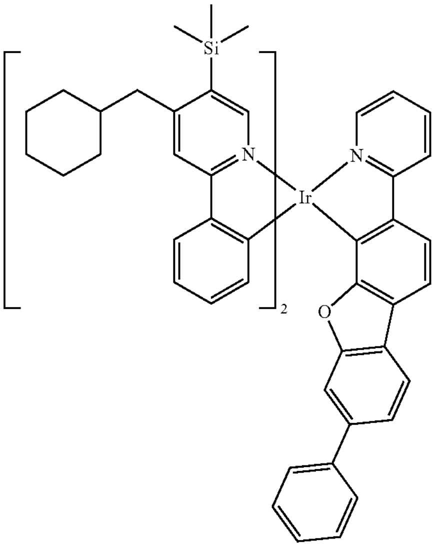
-continued
582
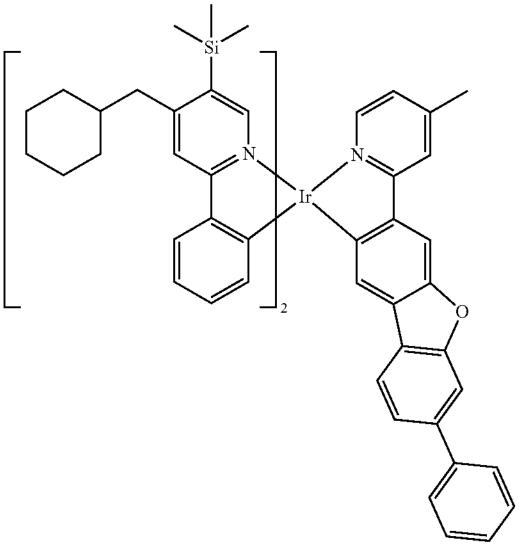
583
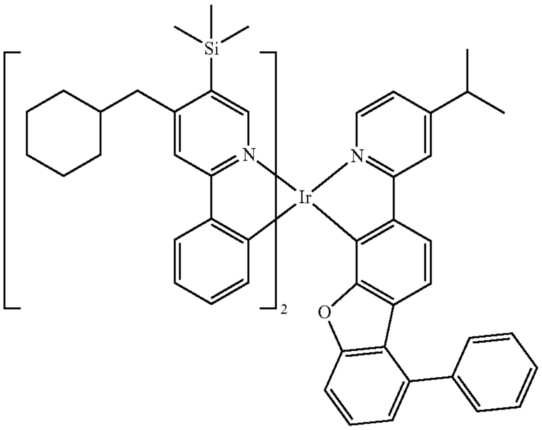
584
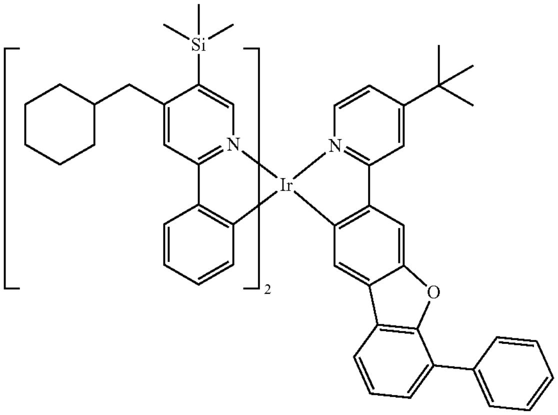

1199
-continued
585
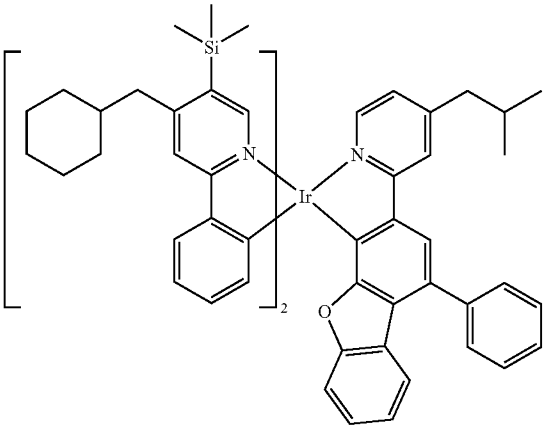
586
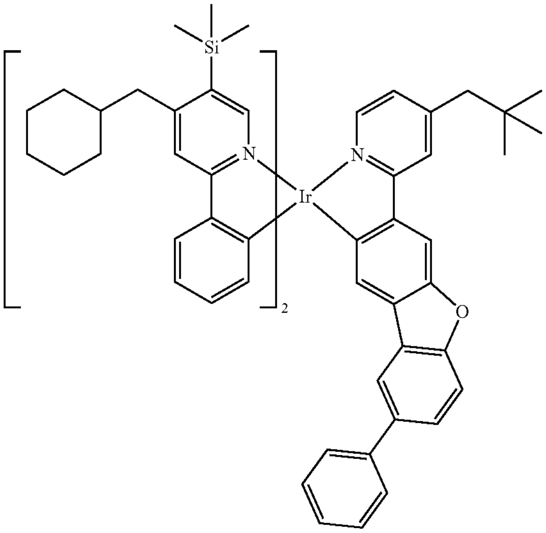
587
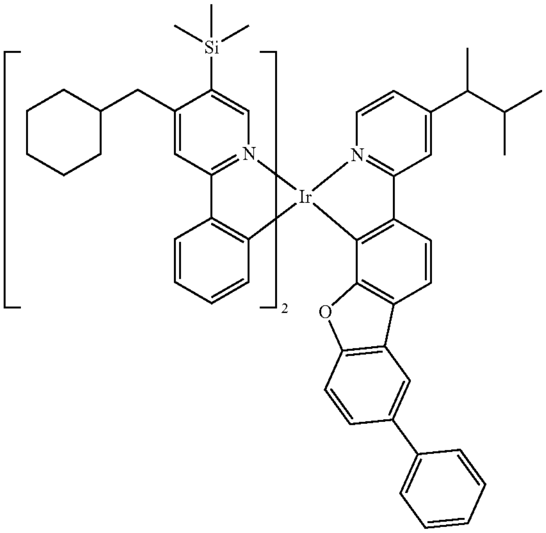
1200
-continued
588
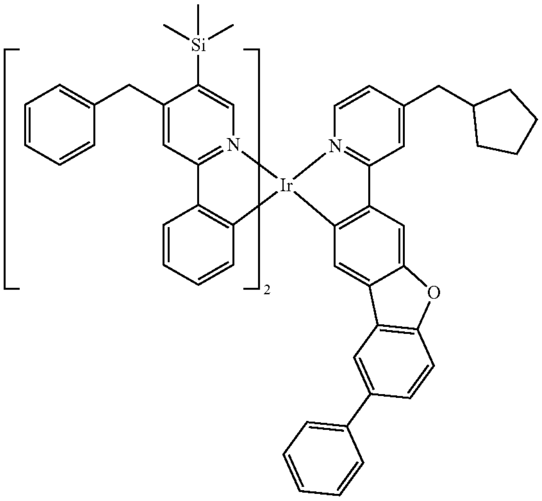
589
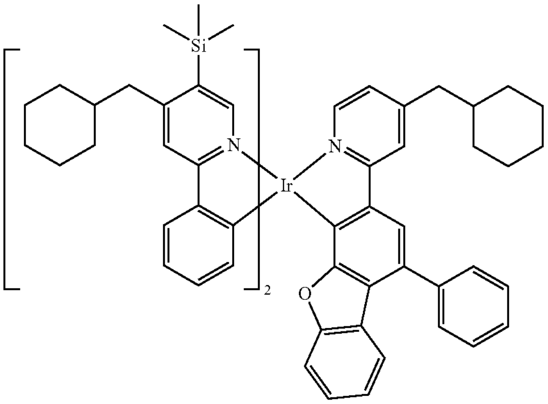
590
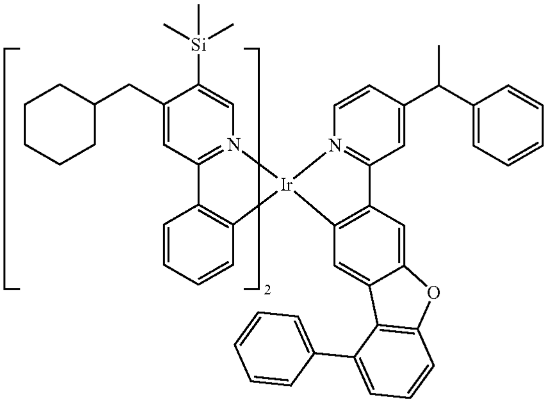

-continued
591
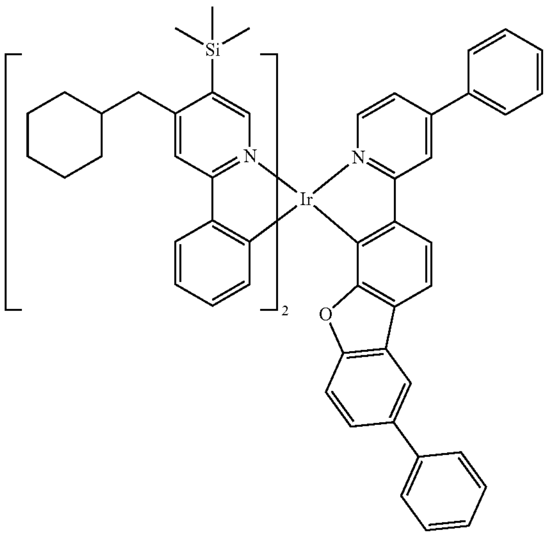
592
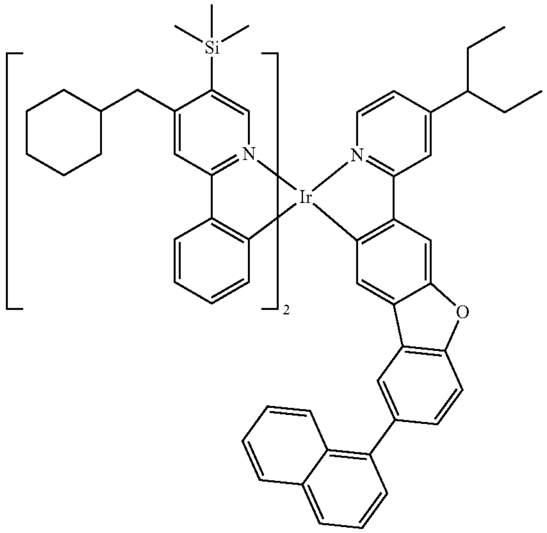
593
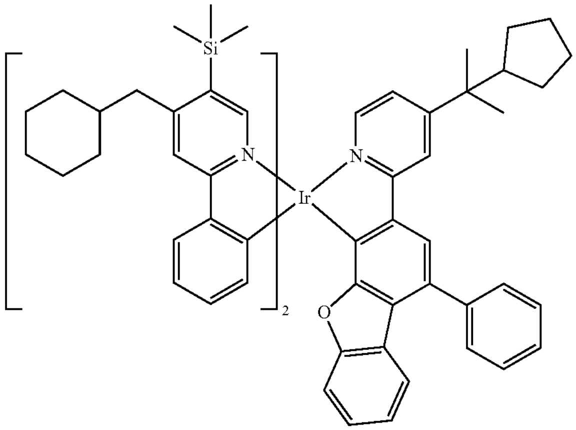
-continued
594
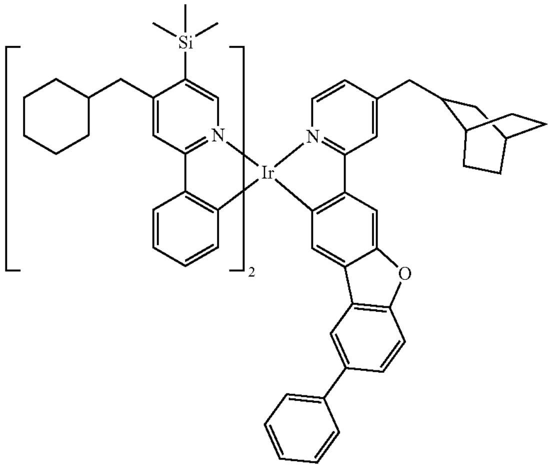
595
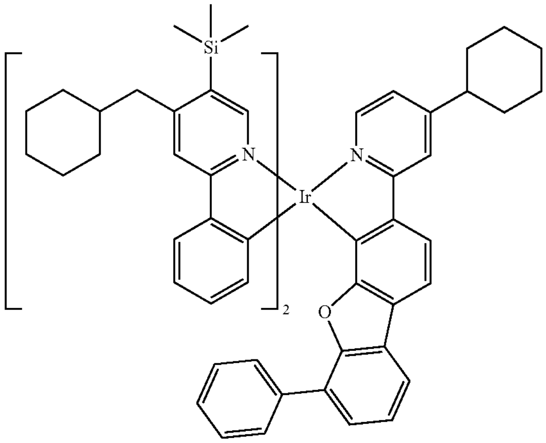
596
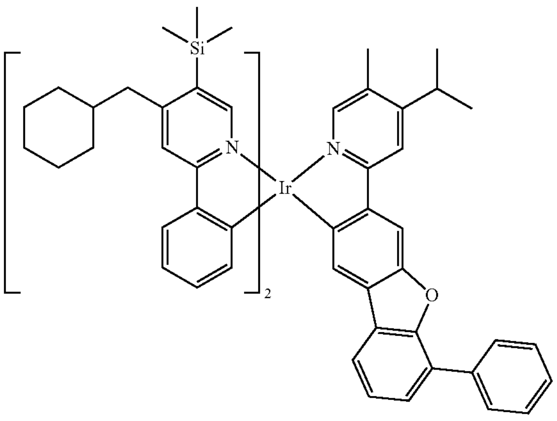

-continued
597
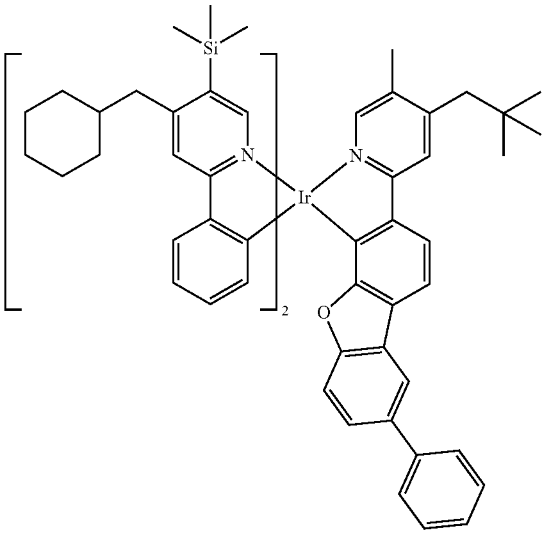
598
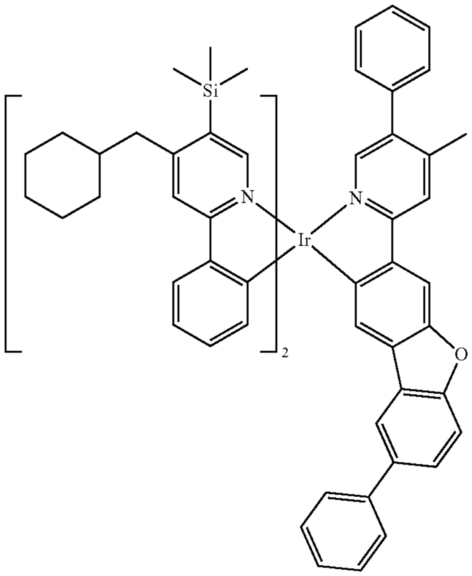
599
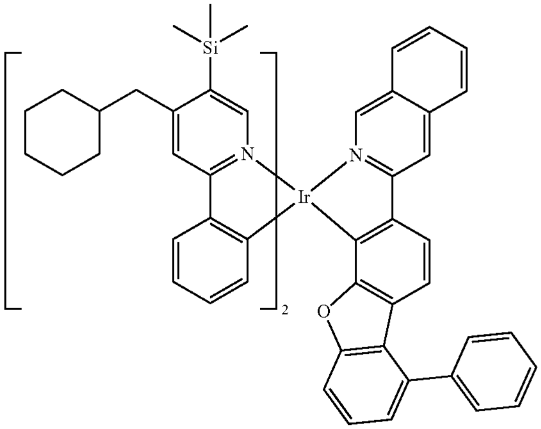
-continued
600
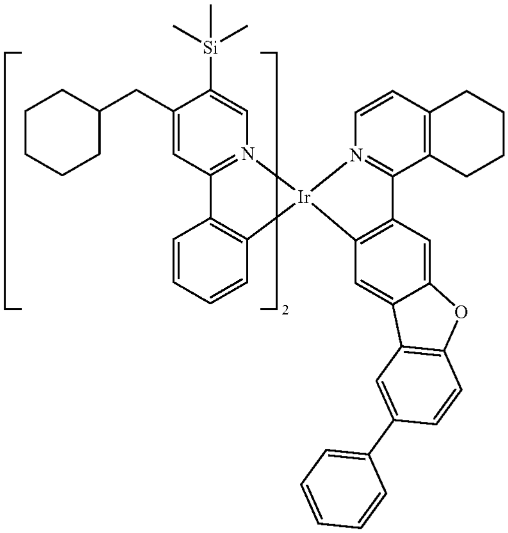
601
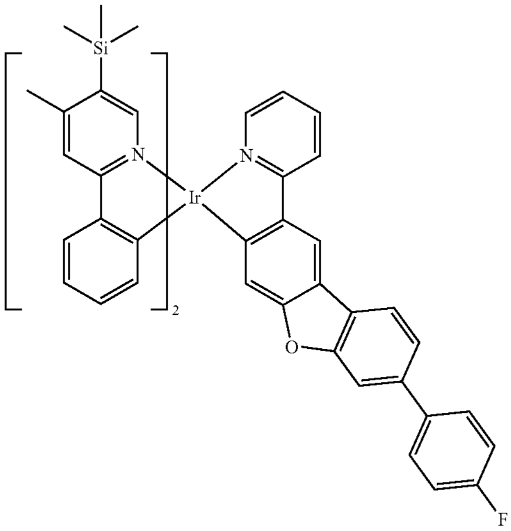
602
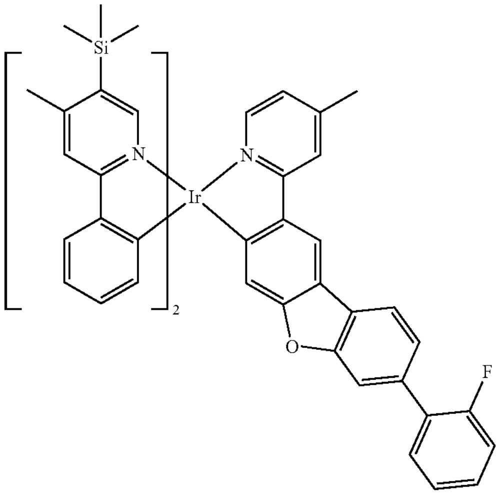

-continued
603
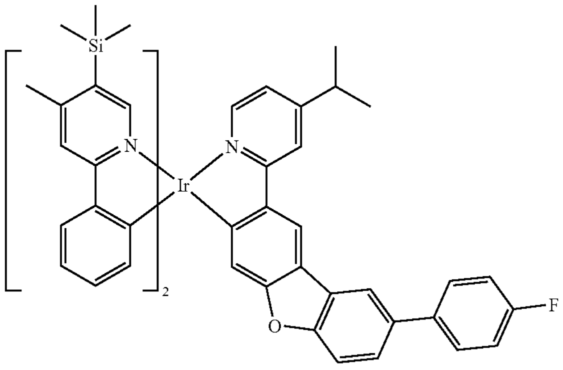
604
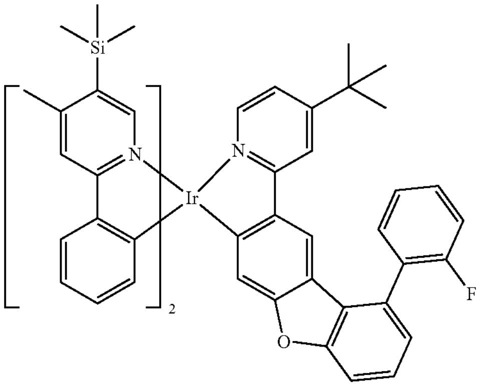
605
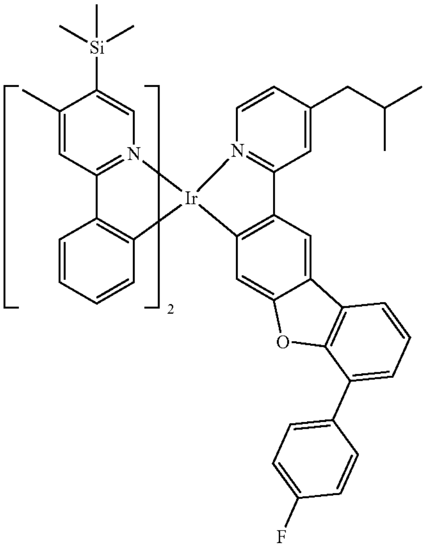
-continued
606
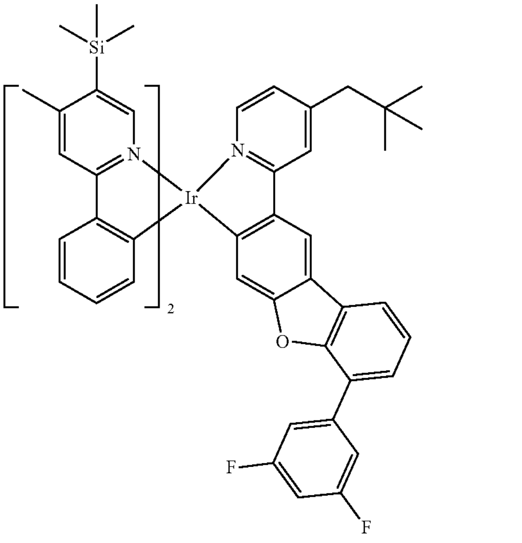
607
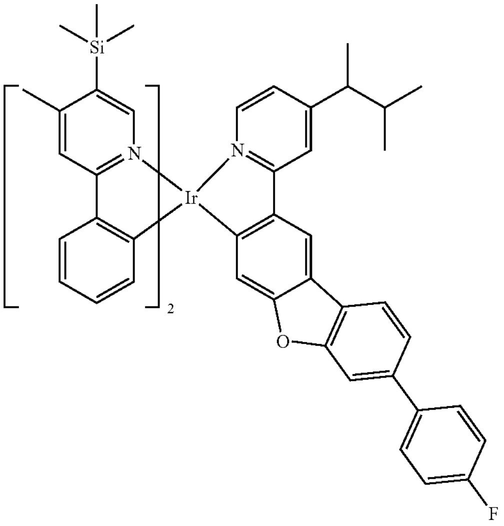
608
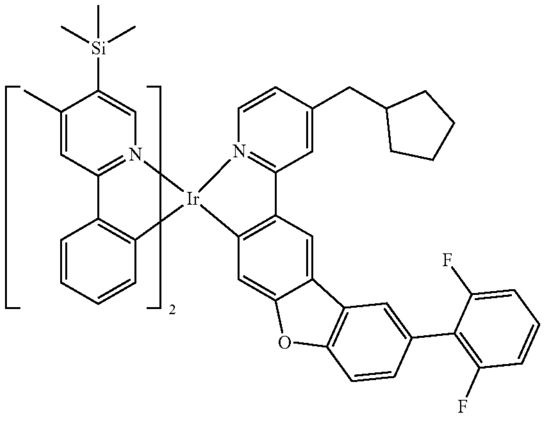

609
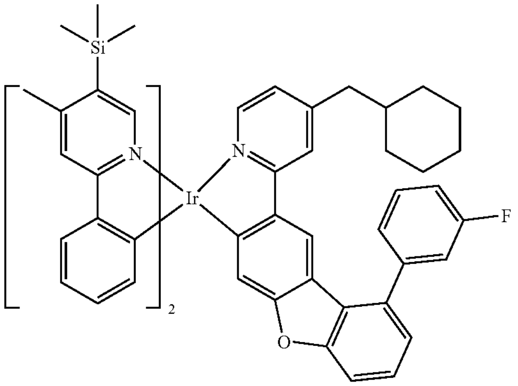
610
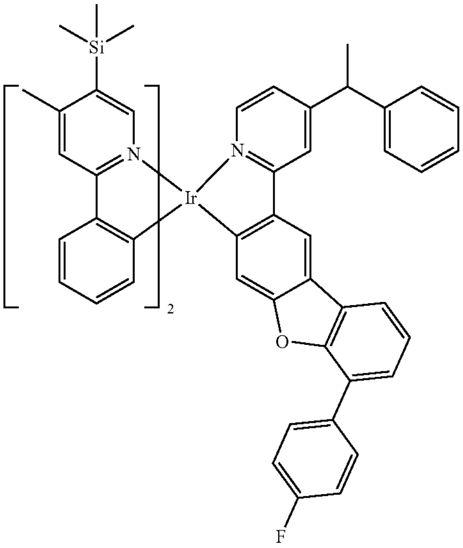
611
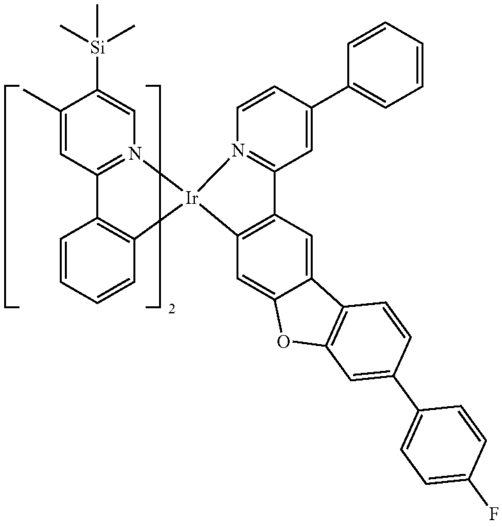
612
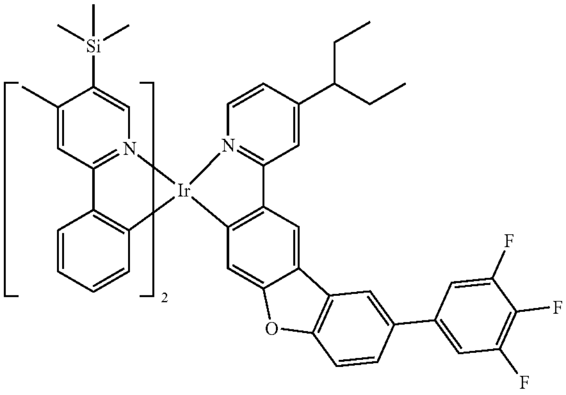
613
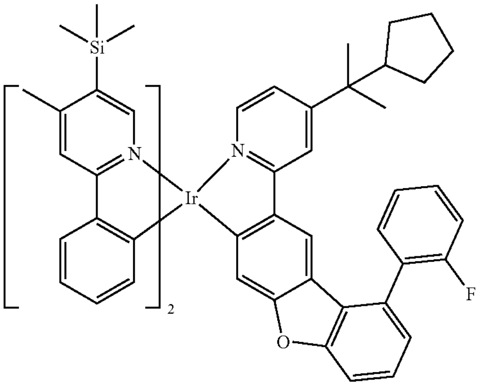
614
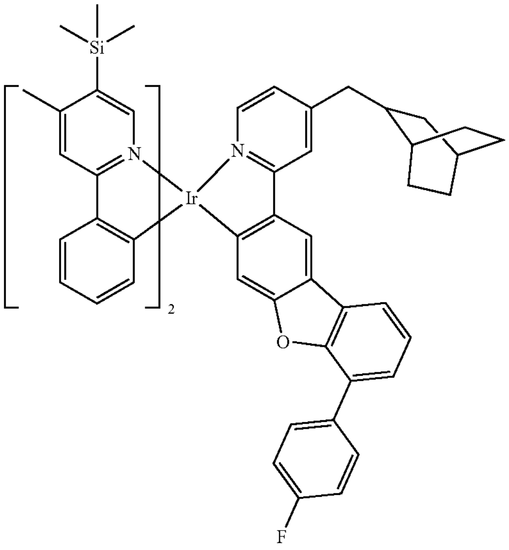

-continued
615
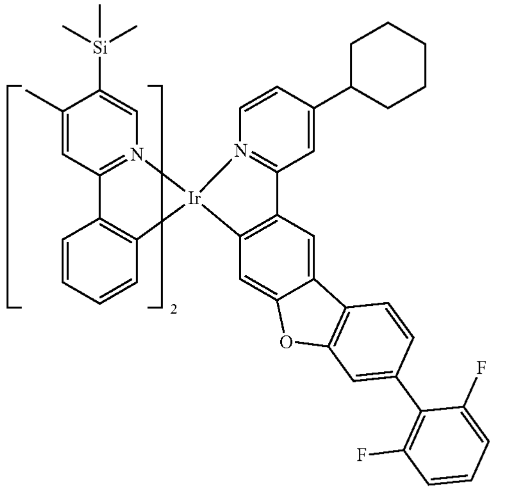
616
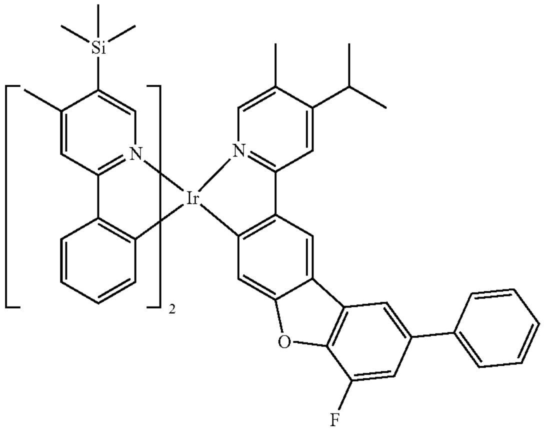
617
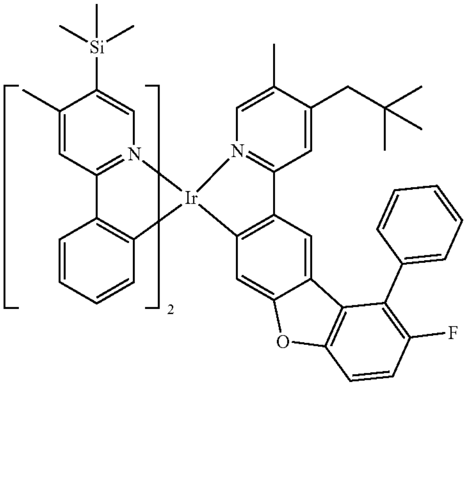
-continued
618
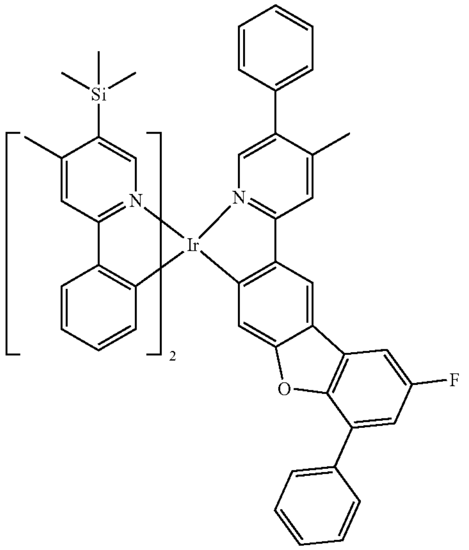
619
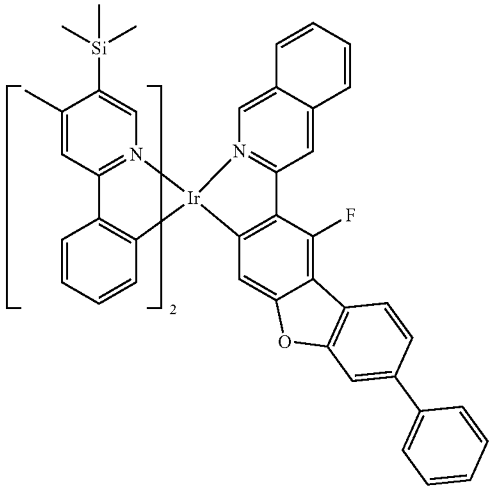
620
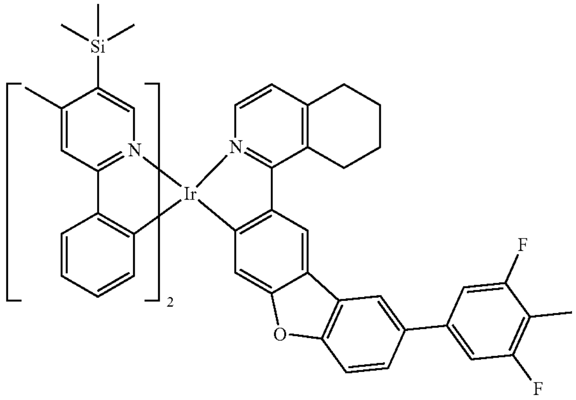

-continued
621
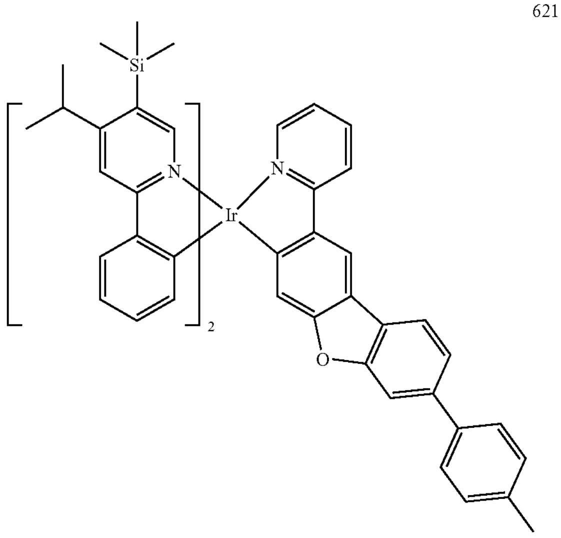
622
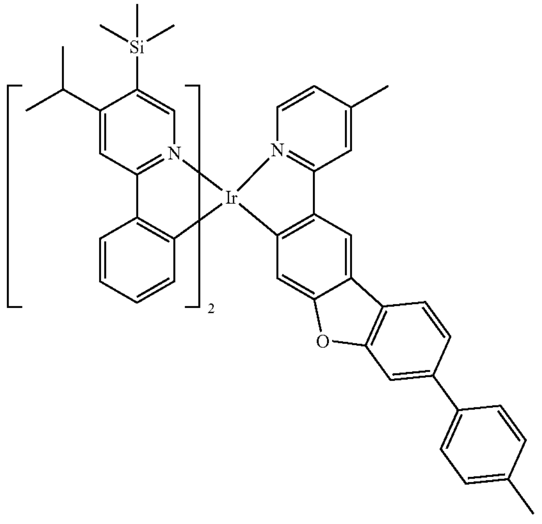
623
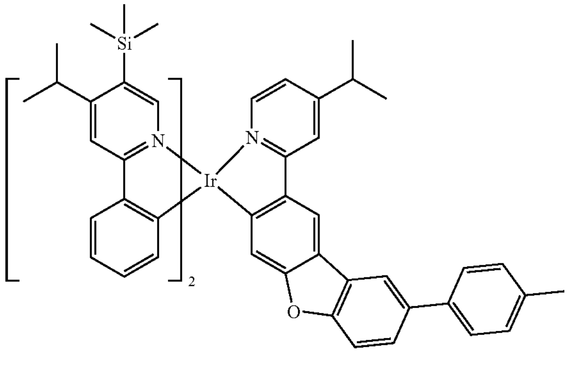
-continued
624
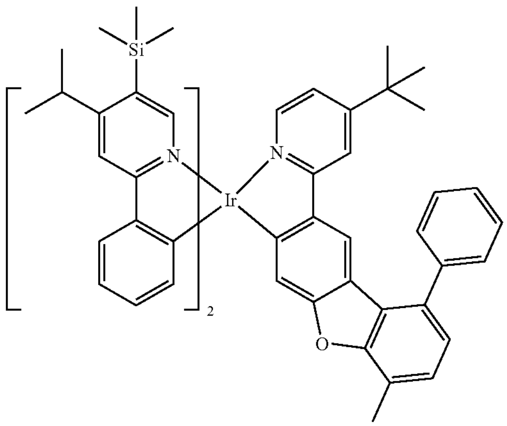
625
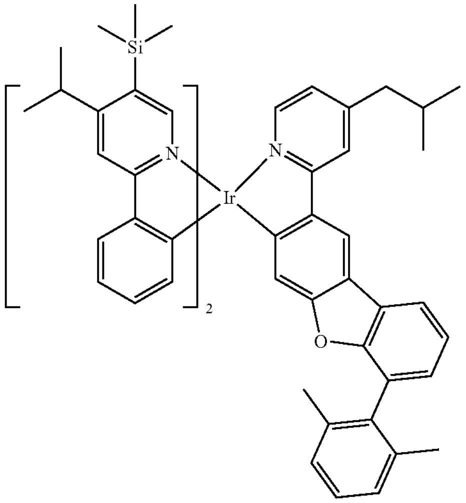
626
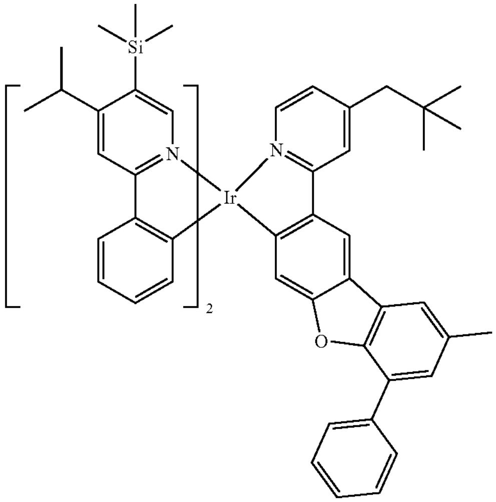

-continued
627
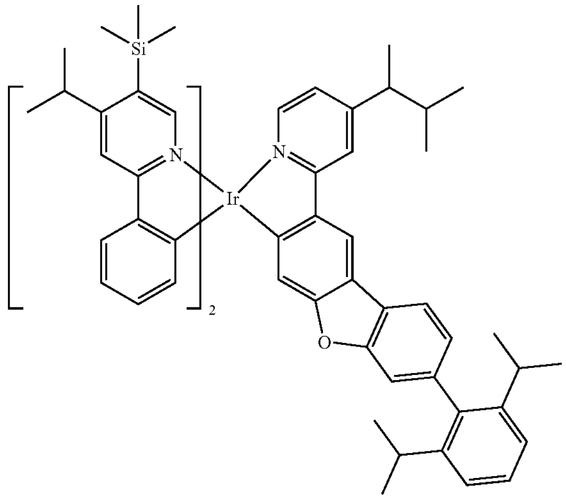
628
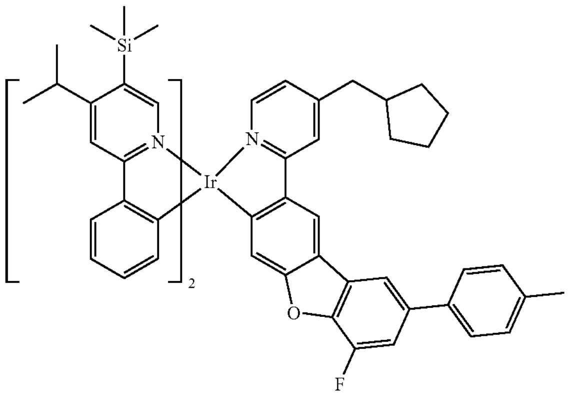
629
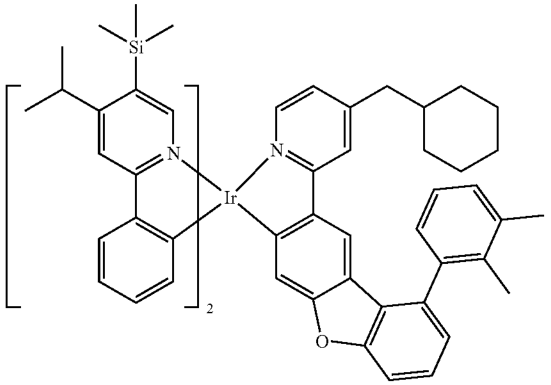
630
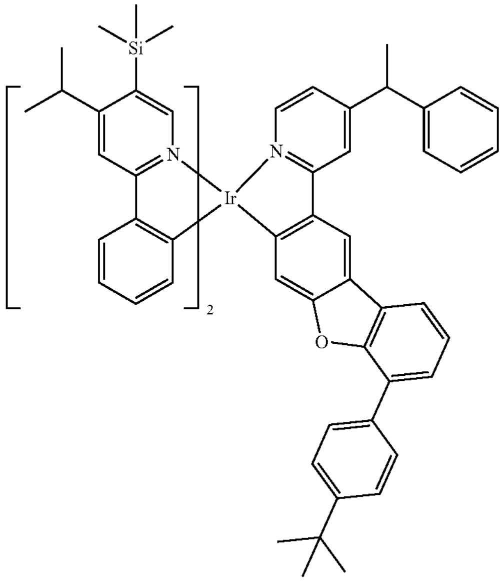
631
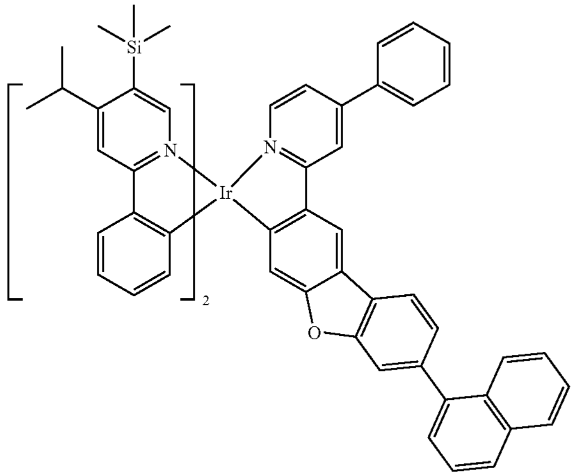
632
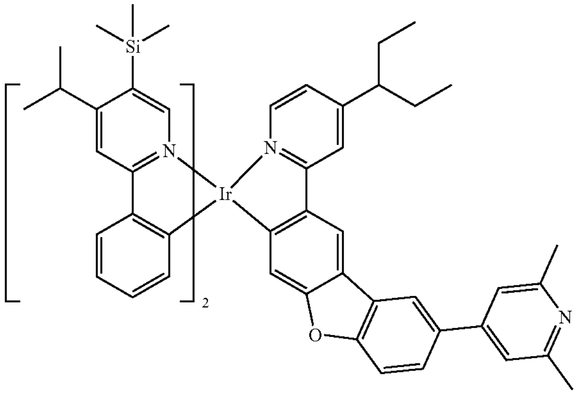

-continued
633
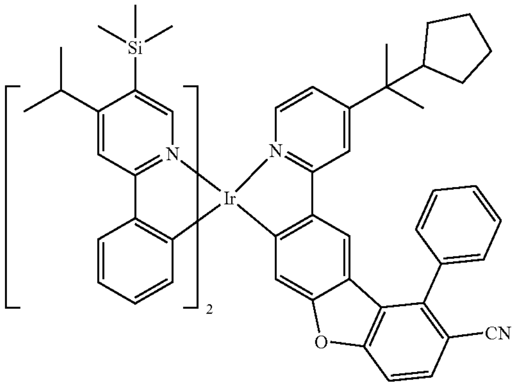
634
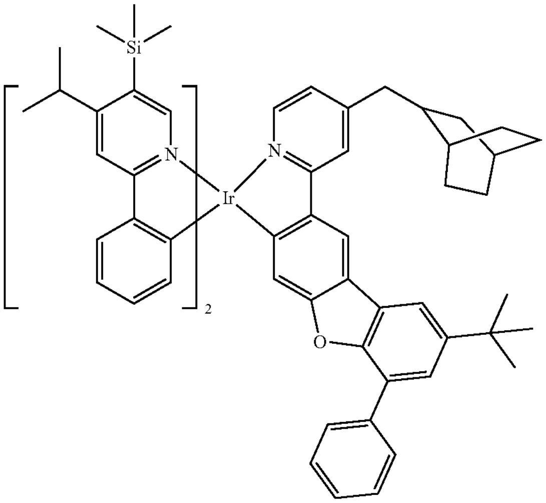
635
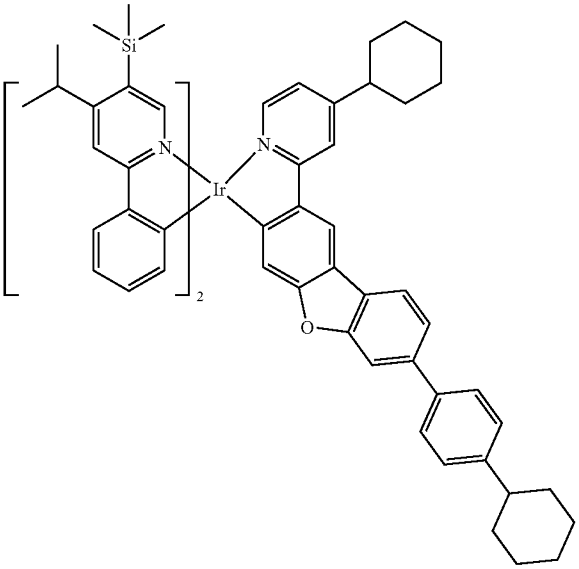
-continued
636
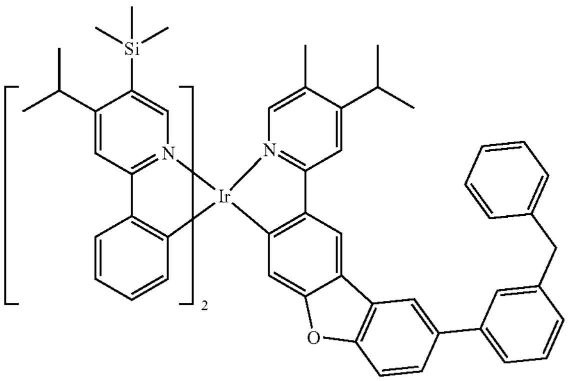
637
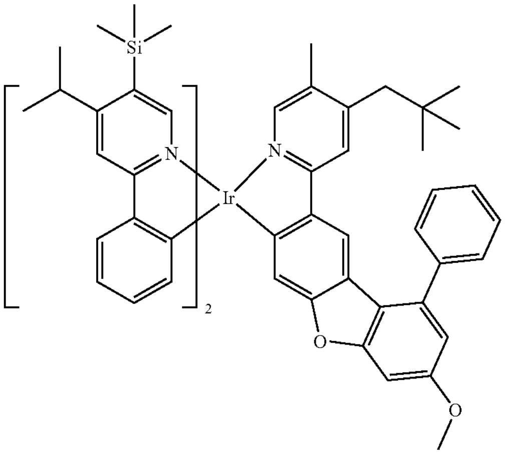
638
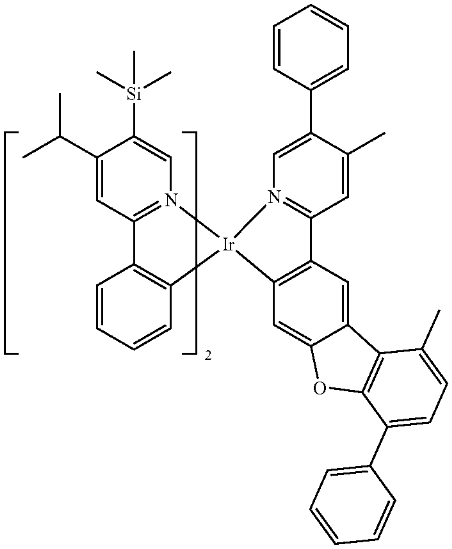

639
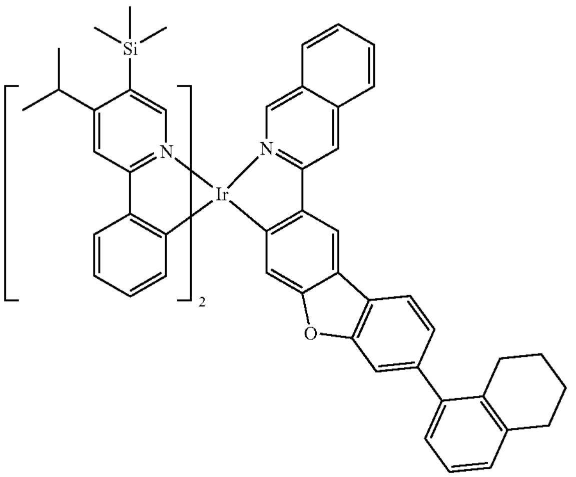
640
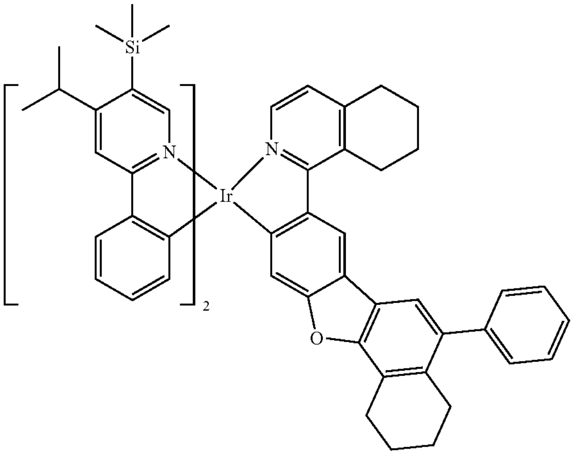
641
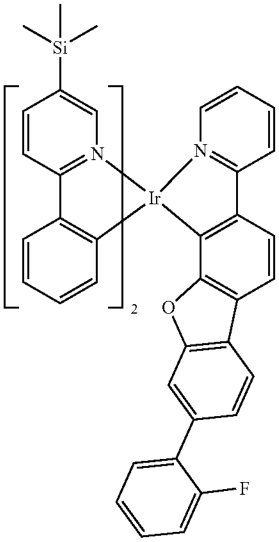
642
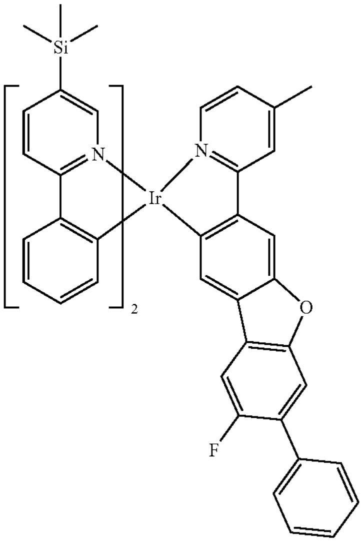
643
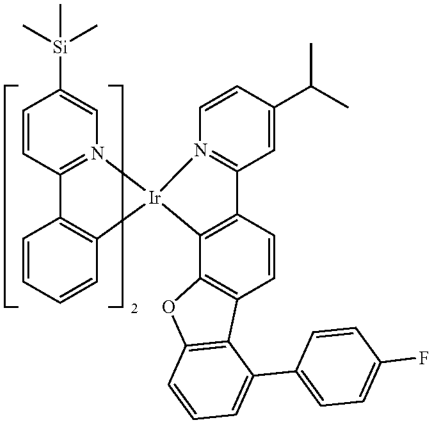
644
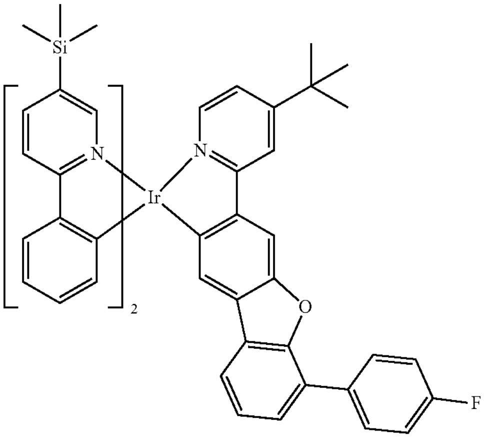

-continued
645
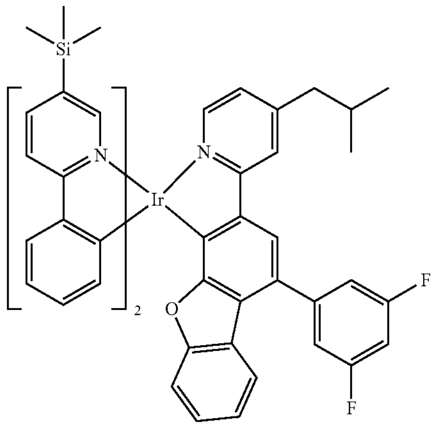
646
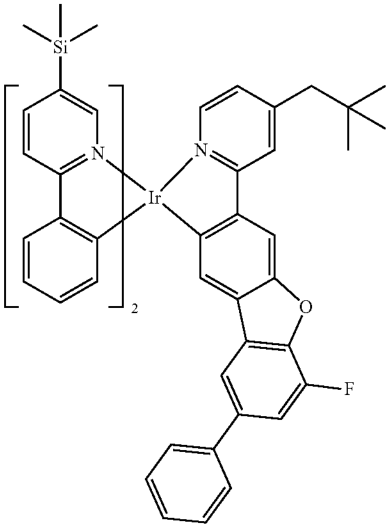
647
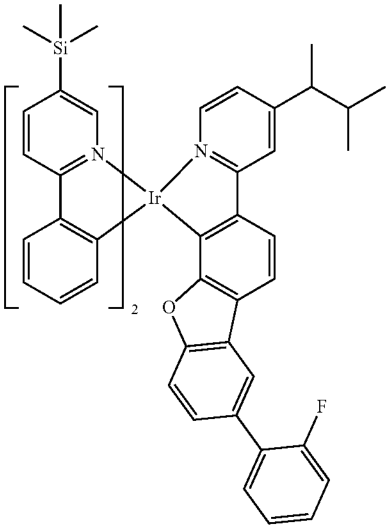
-continued
648
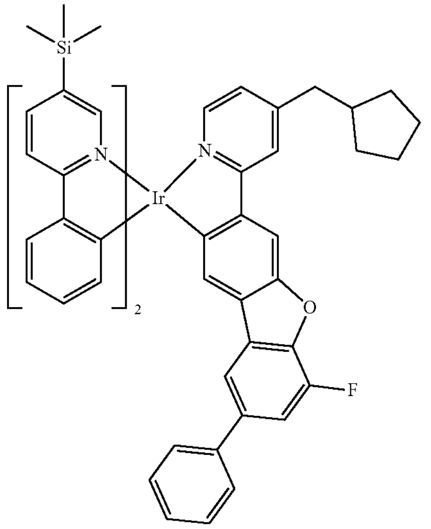
649
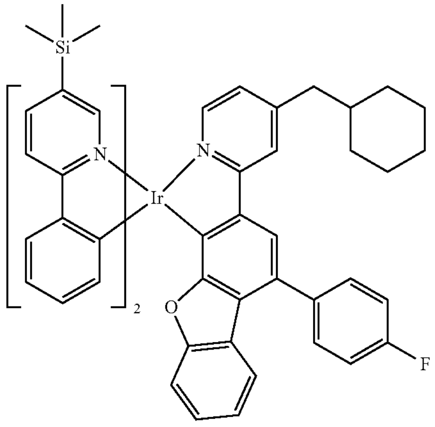
650
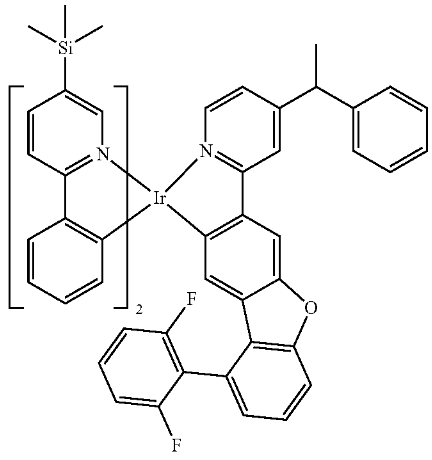

-continued
651
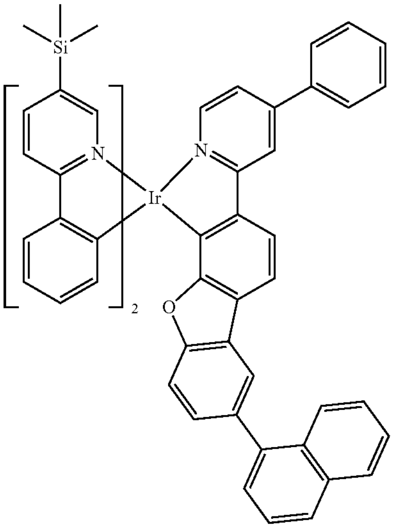
652
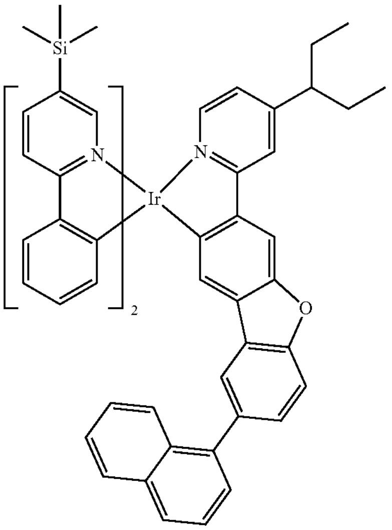
653
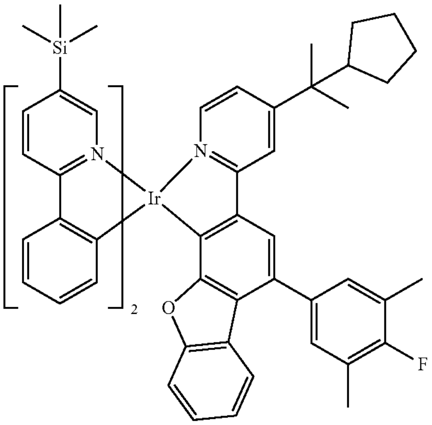
-continued
654
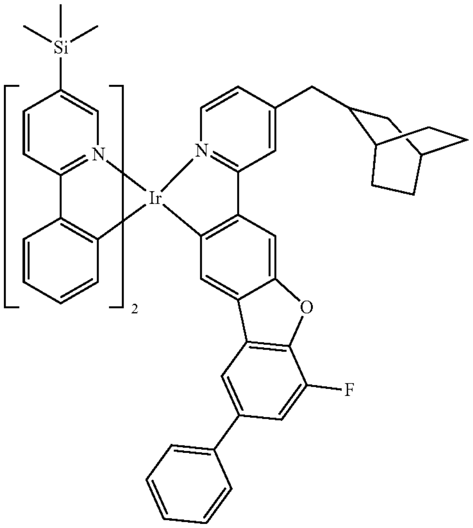
655
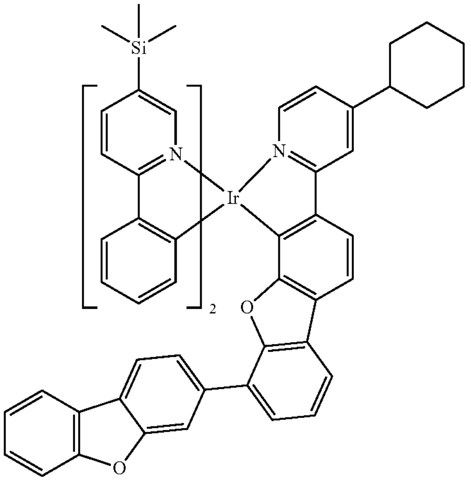
656
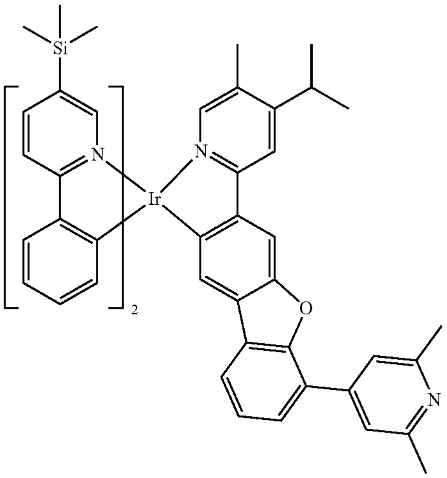

-continued
657
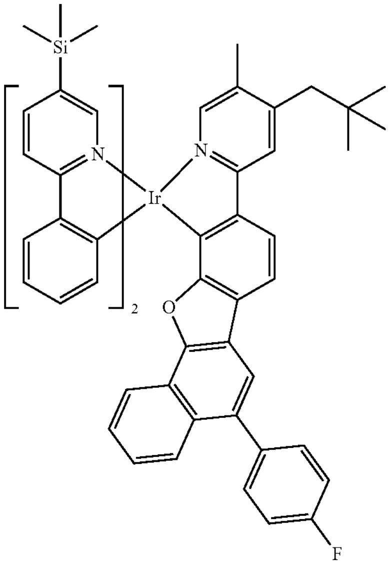
658
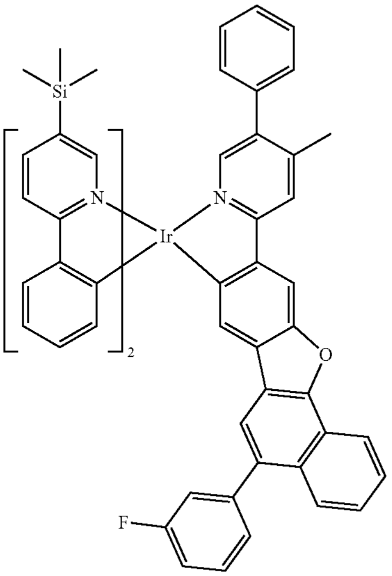
-continued
659
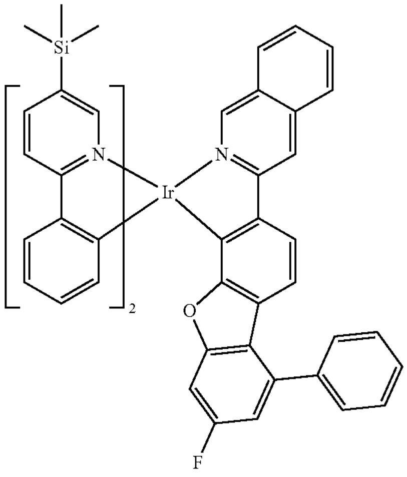
660
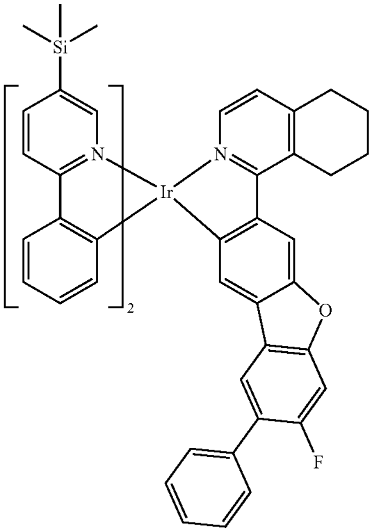
661
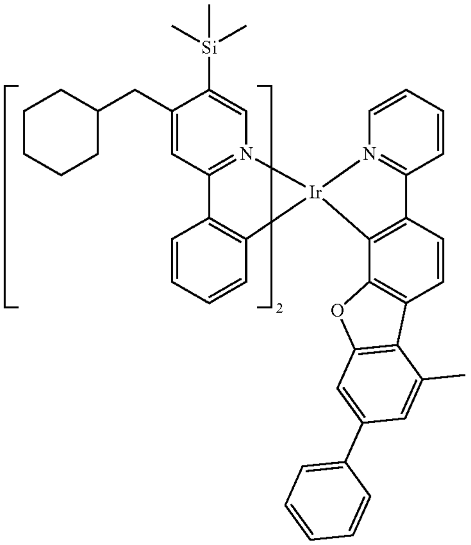

-continued
662
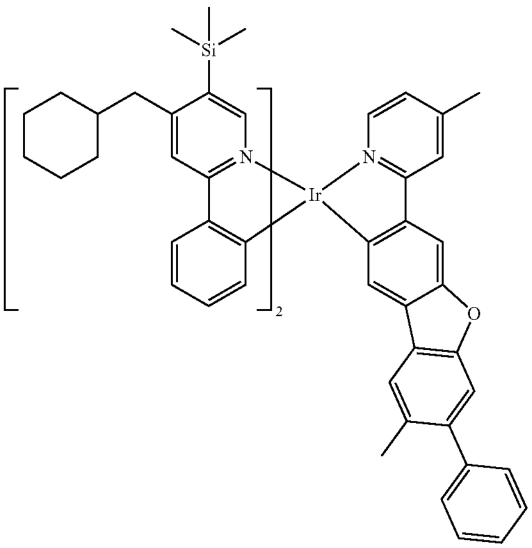
663
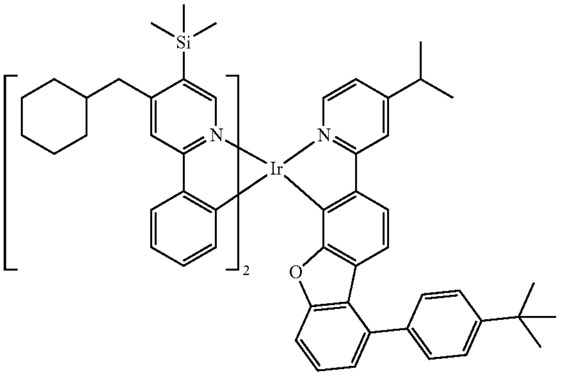
664
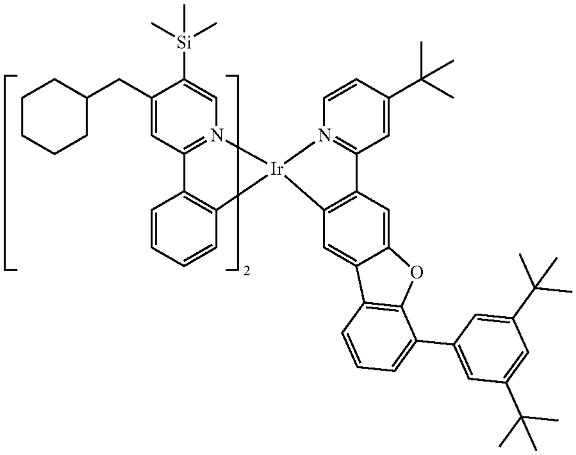
-continued
665
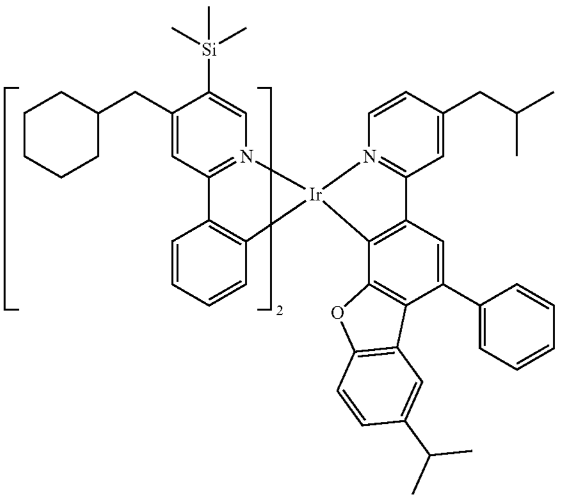
666
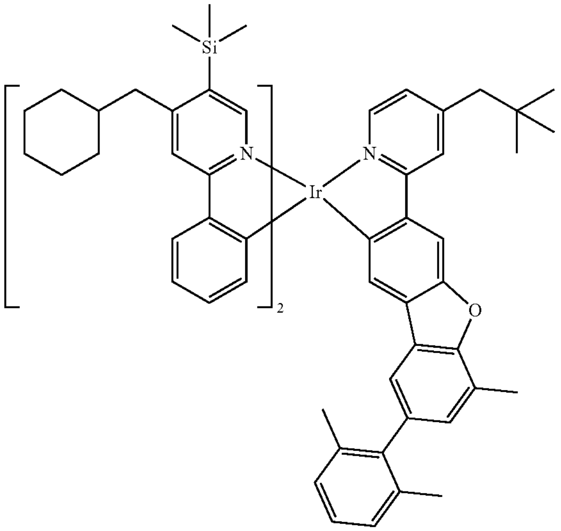
667
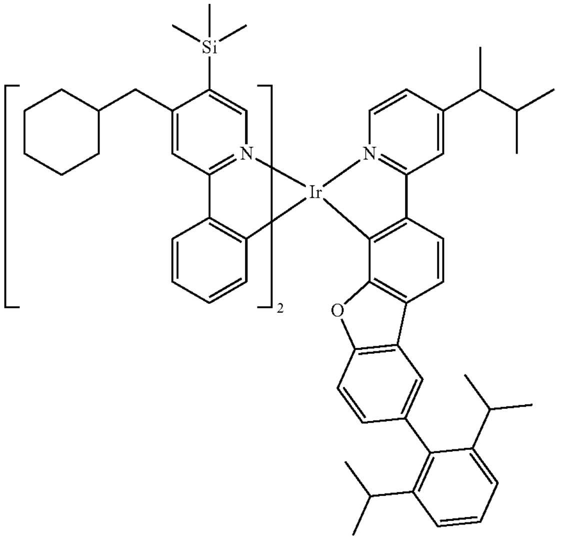

-continued
668
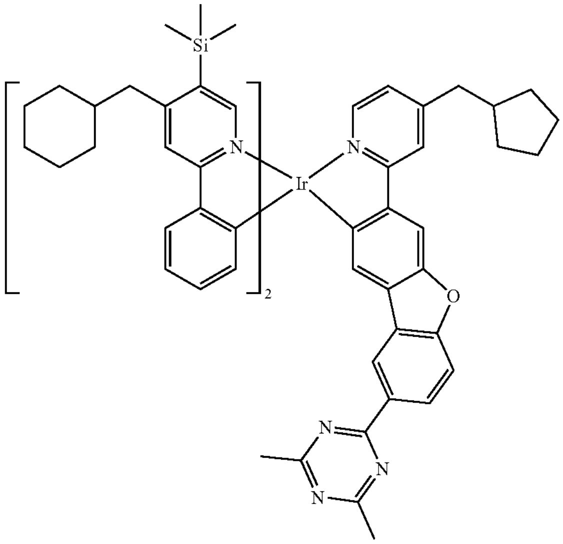
669
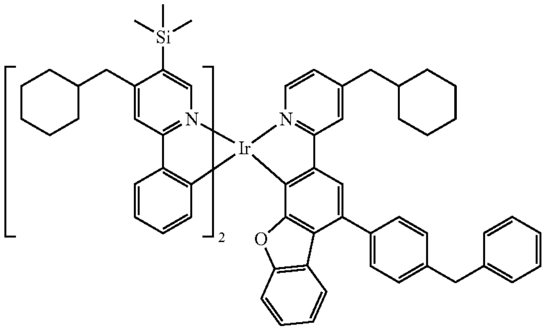
670
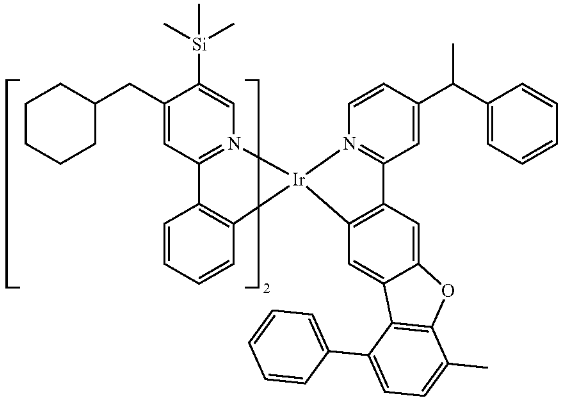
-continued
671
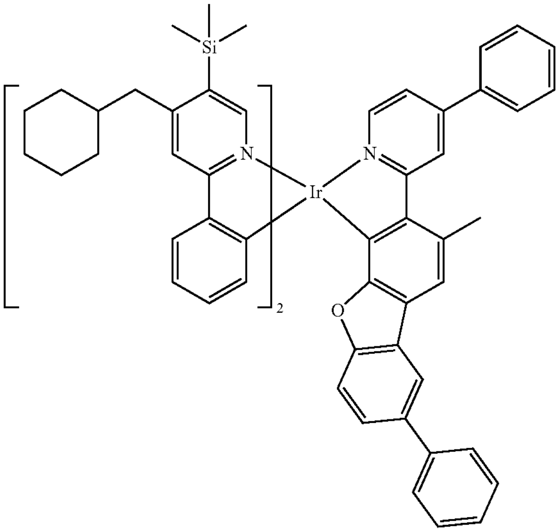
672
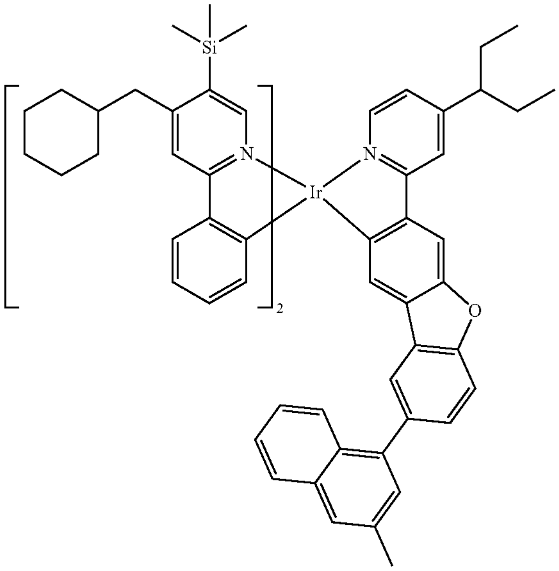
673
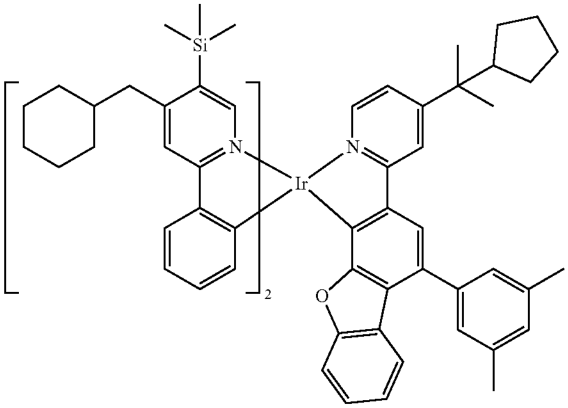

674
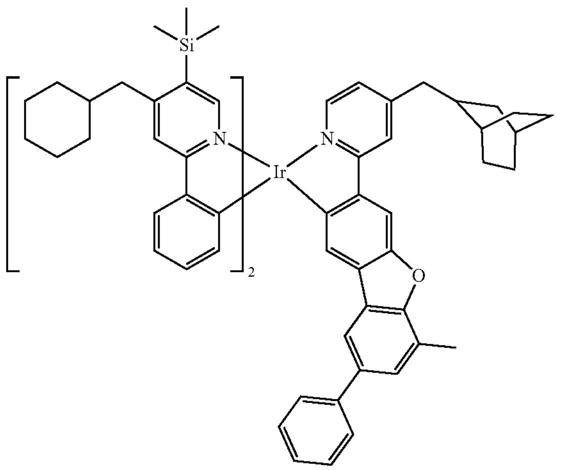
675
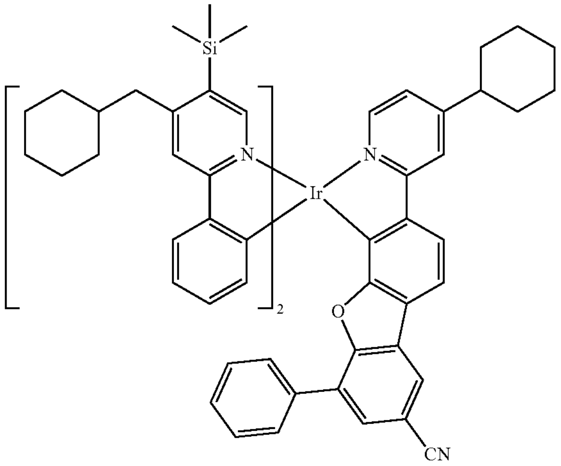
676
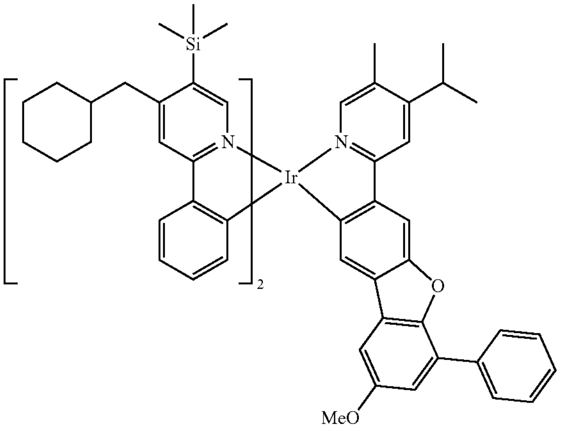
677
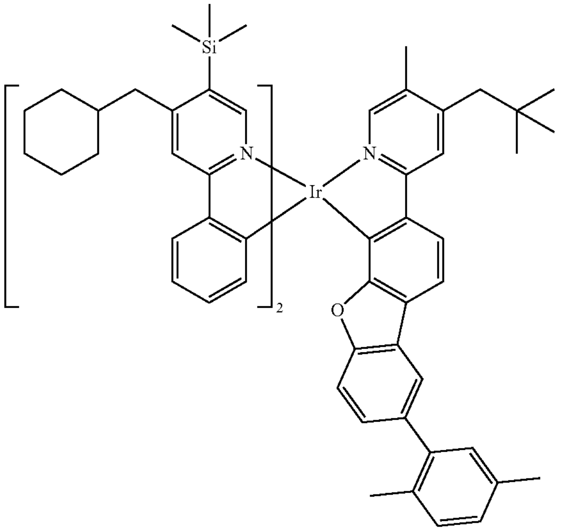
678
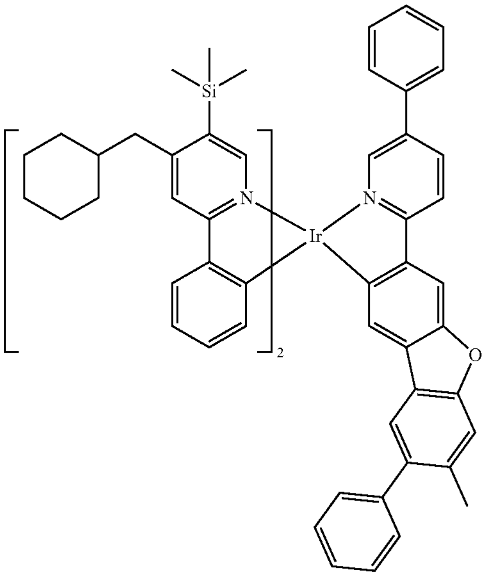
679
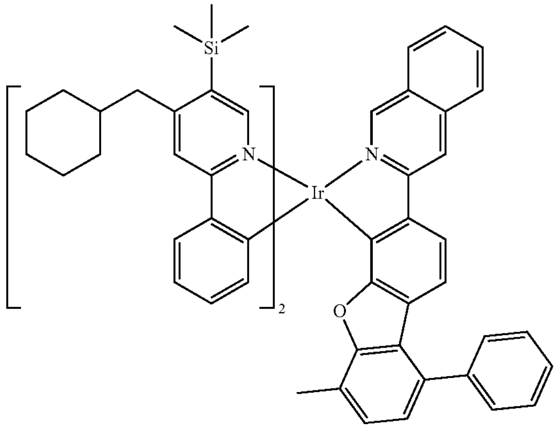

-continued
680
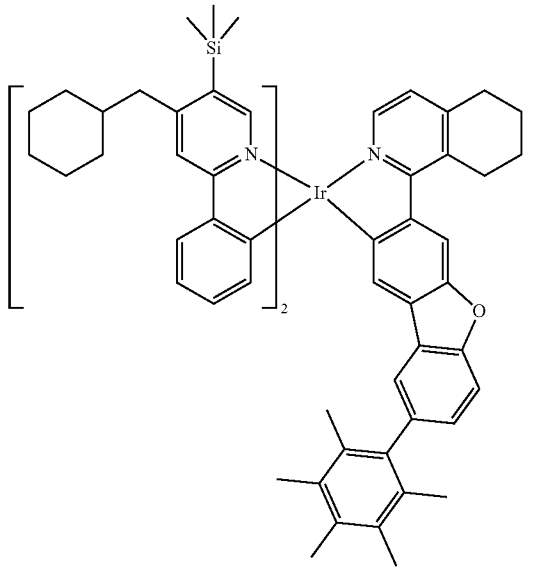
681
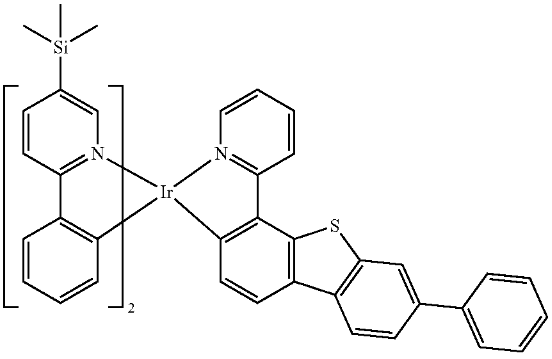
682
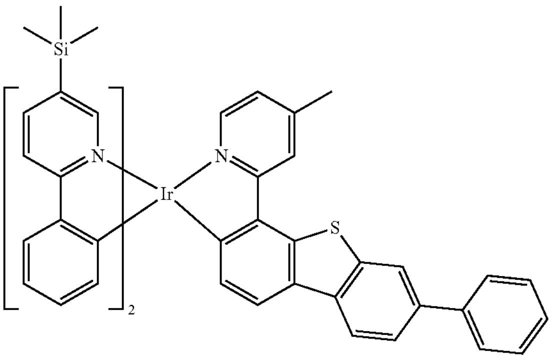
-continued
683
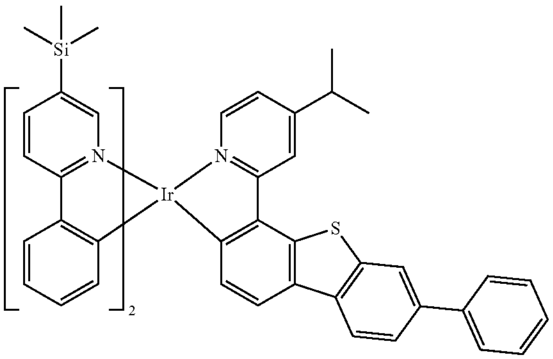
684
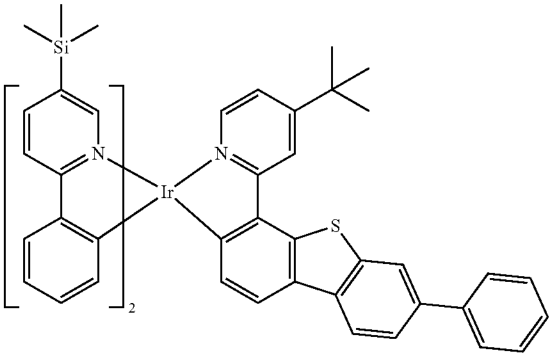
685
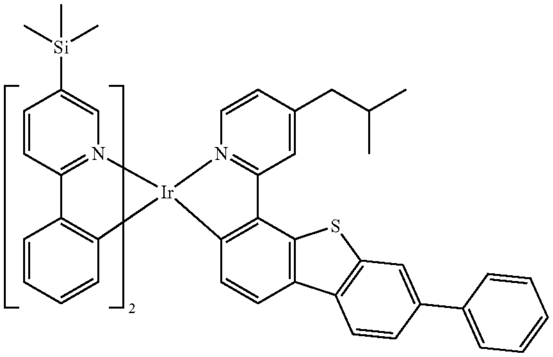
686
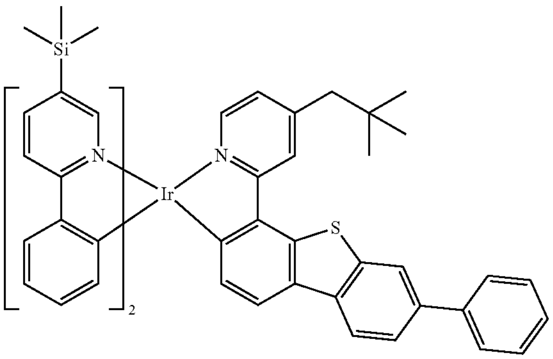

-continued
687
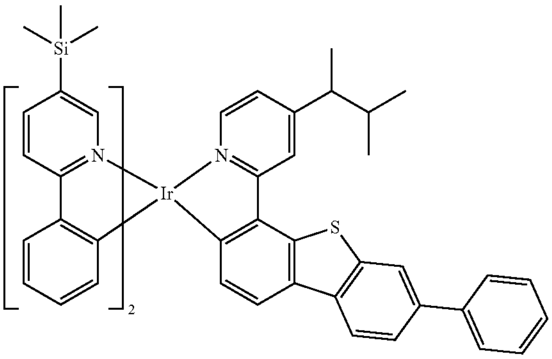
688
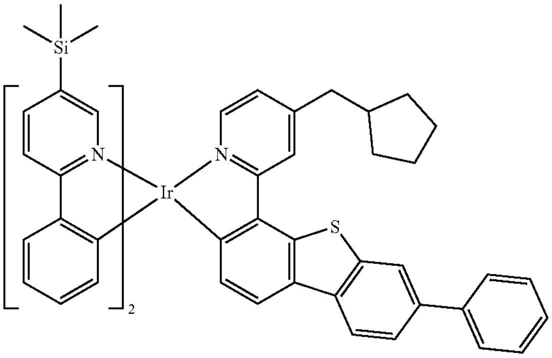
689
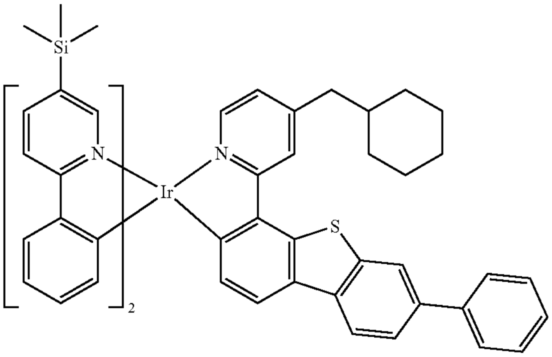
690
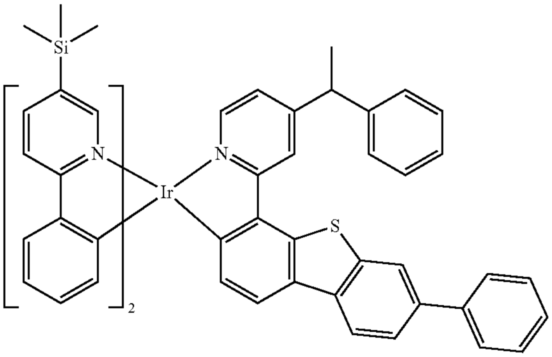
-continued
691
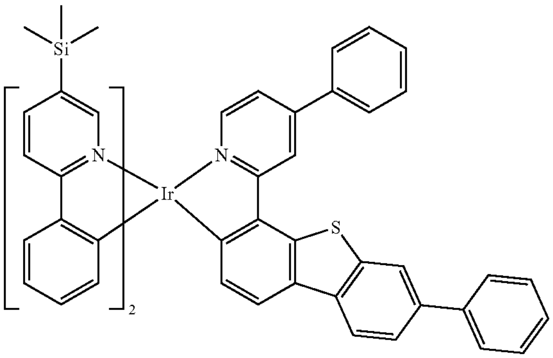
692
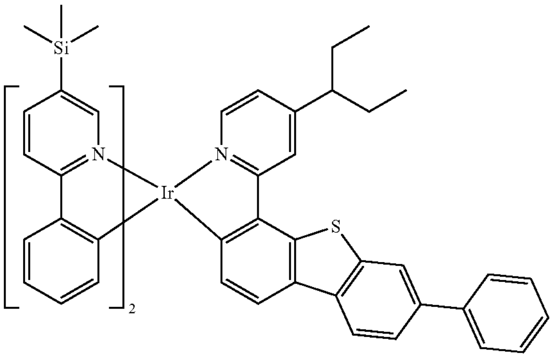
693
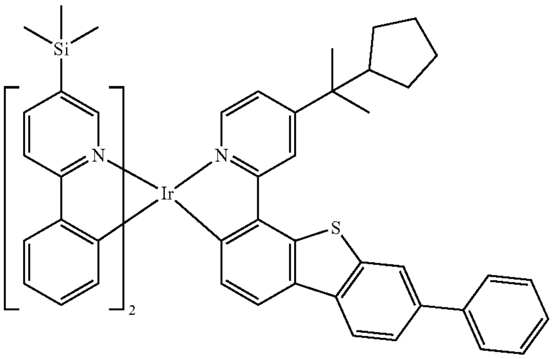
694
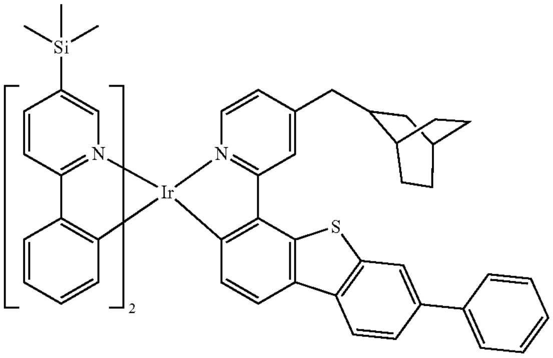

-continued
695
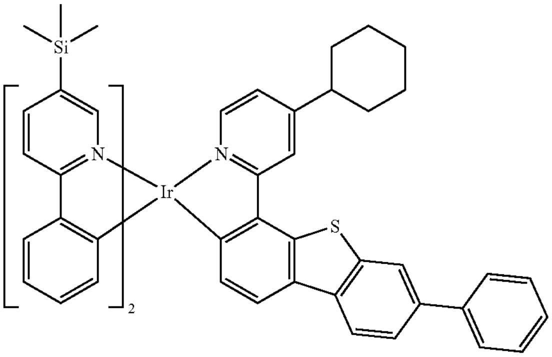
696
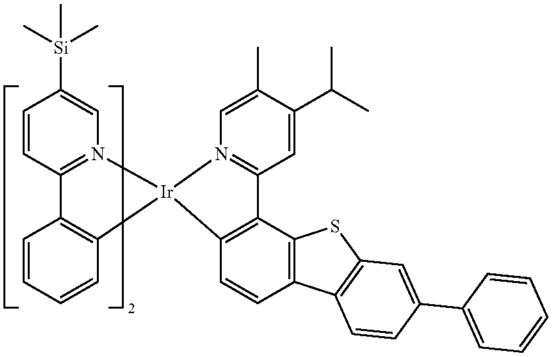
697
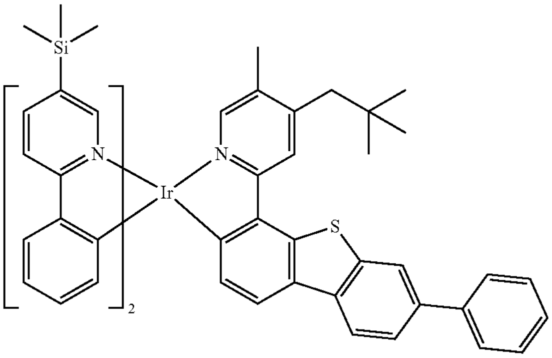
698
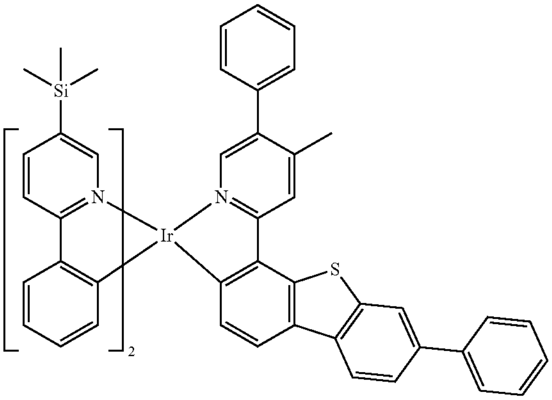
-continued
699
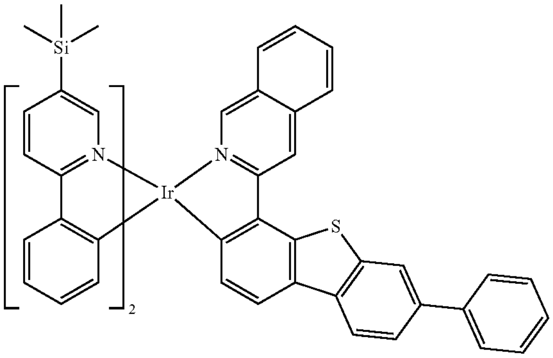
700
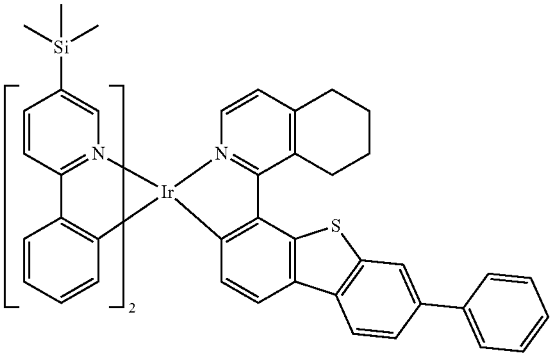
701
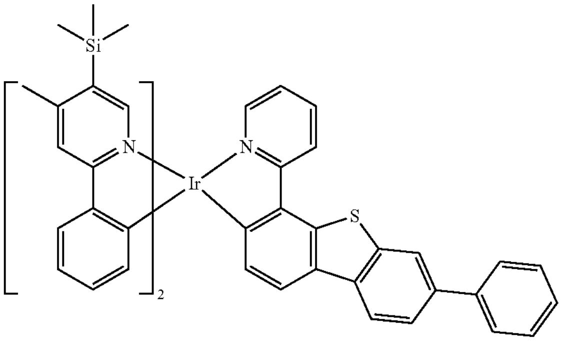
702
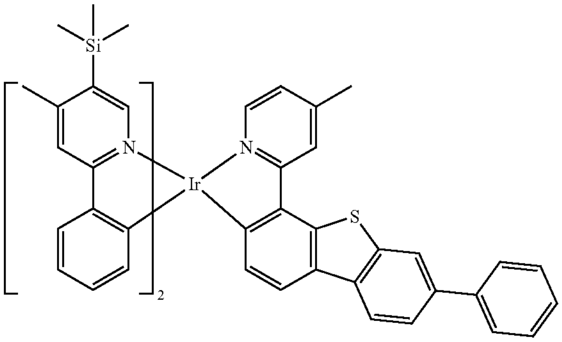

-continued
703
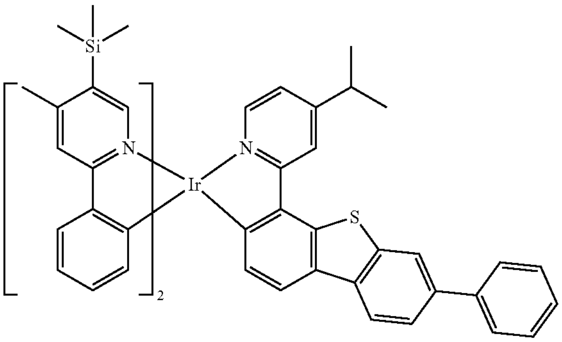
704
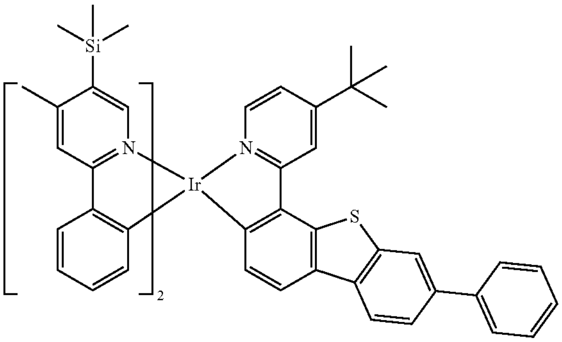
705
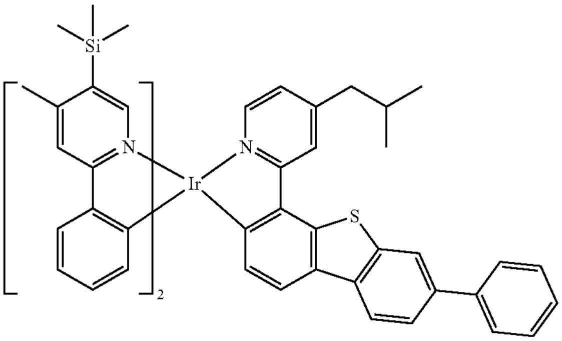
706
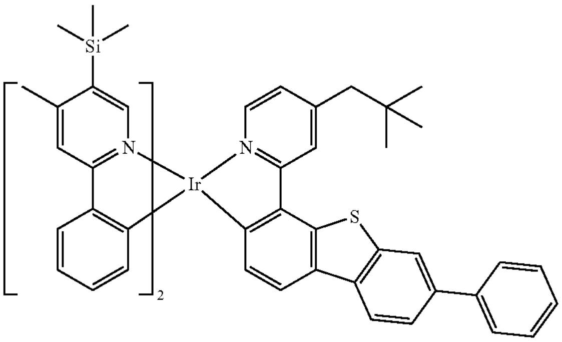
-continued
707
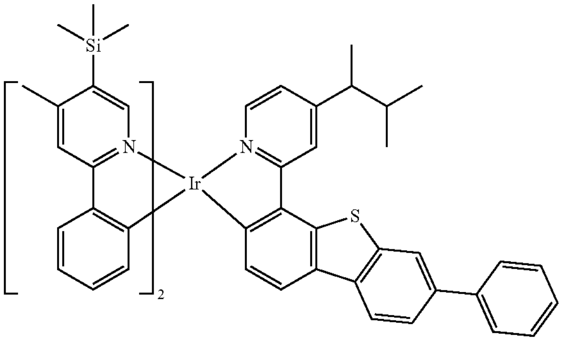
708
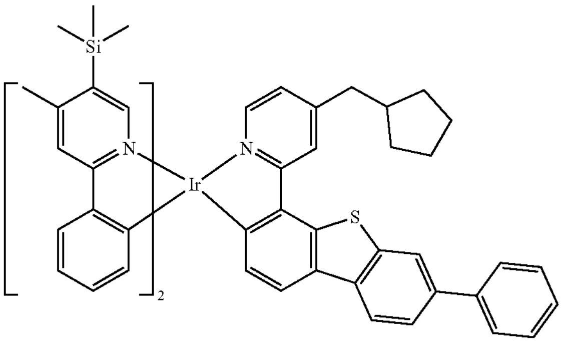
709
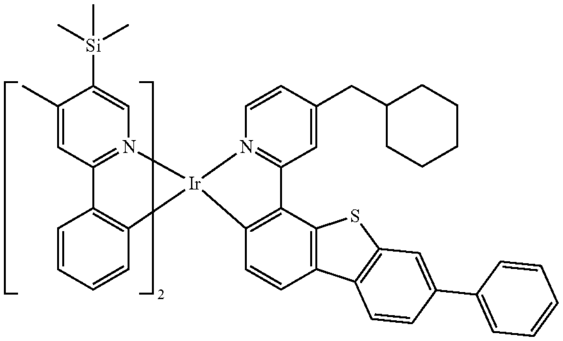
710
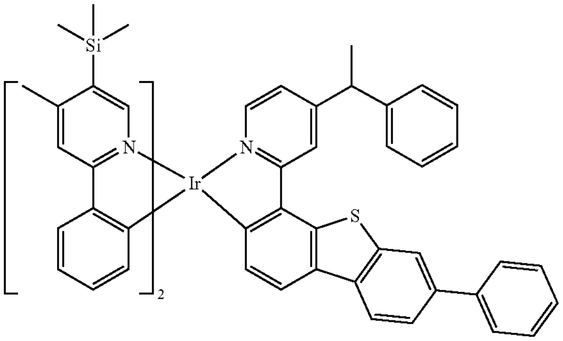

-continued
711
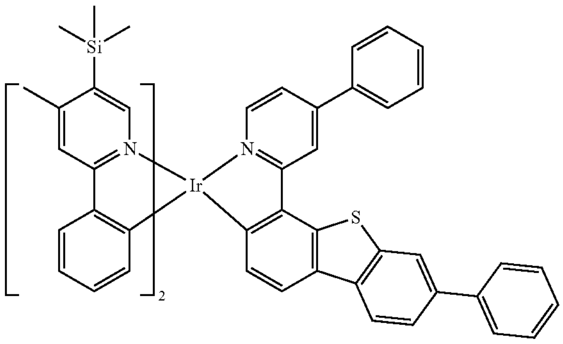
712
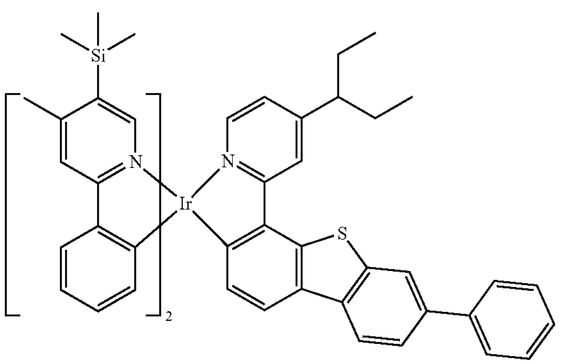
713
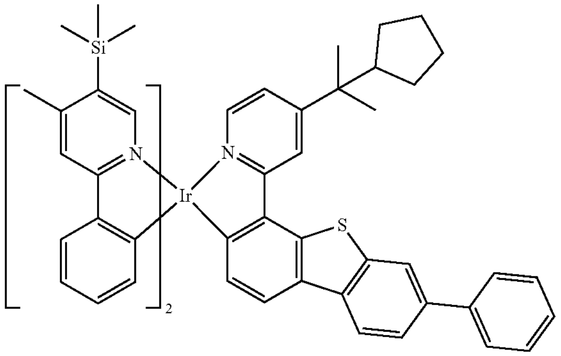
714
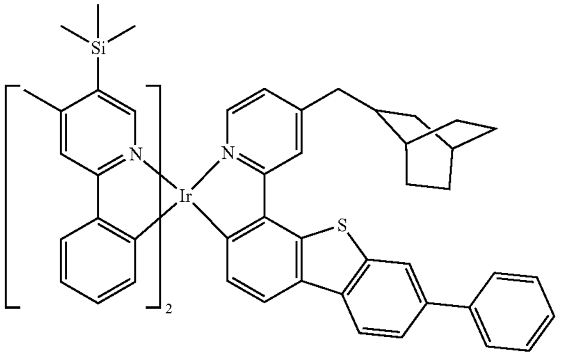
-continued
715
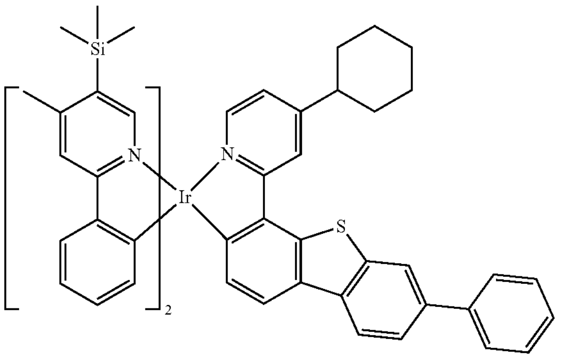
716
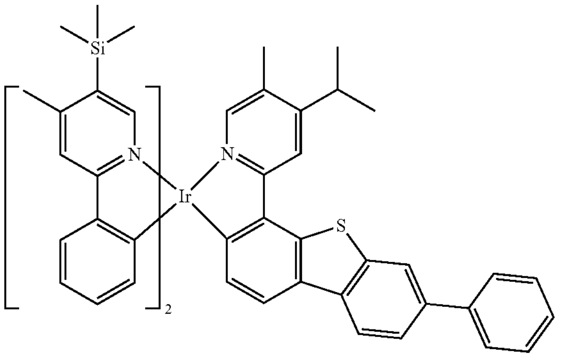
717
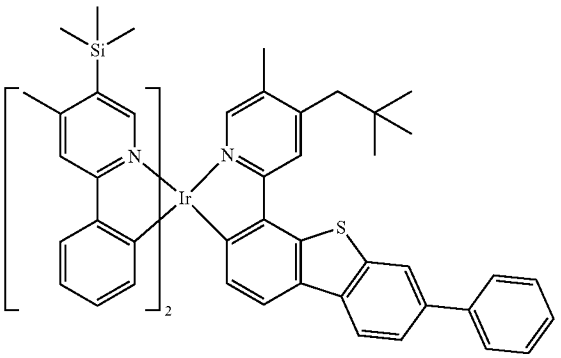
718
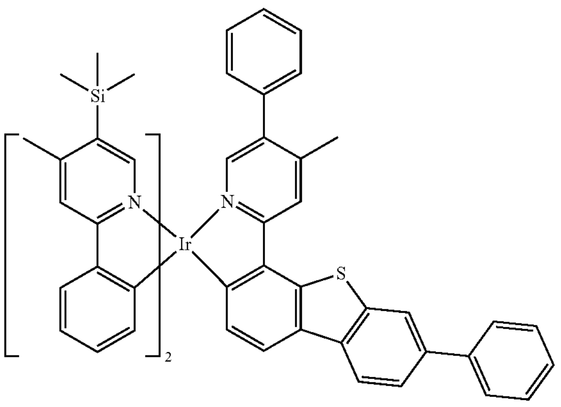

-continued
719
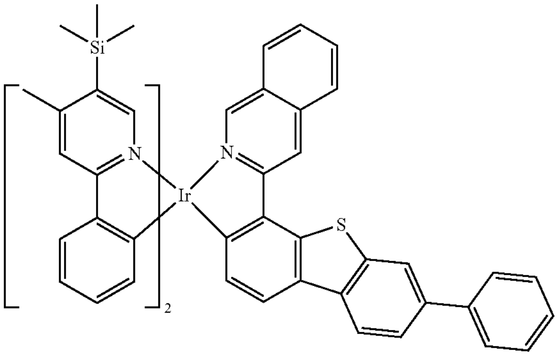
720
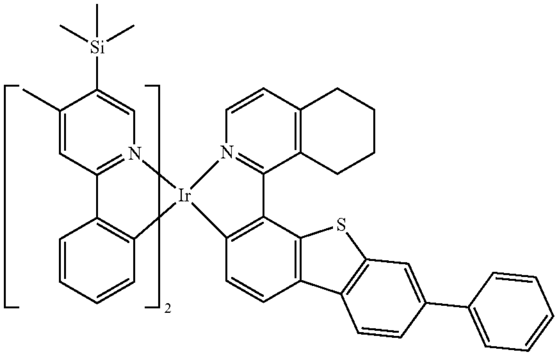
721
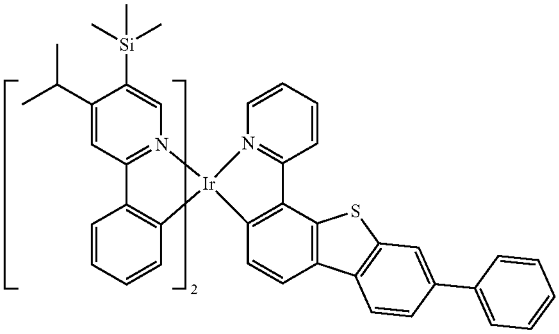
722
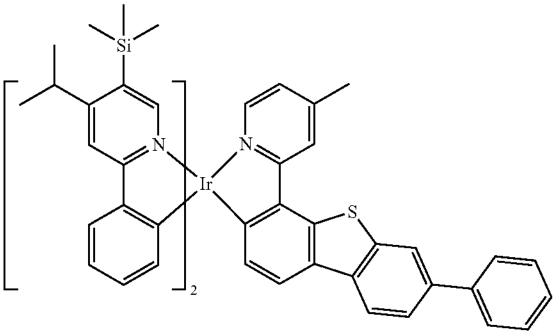
-continued
723
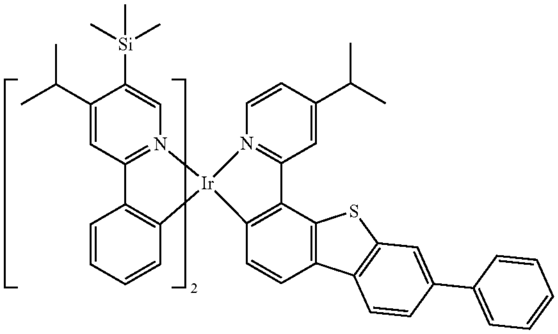
724
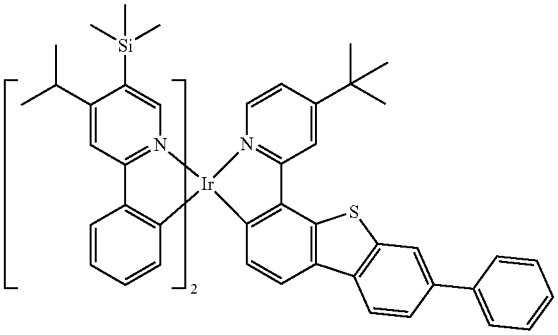
725
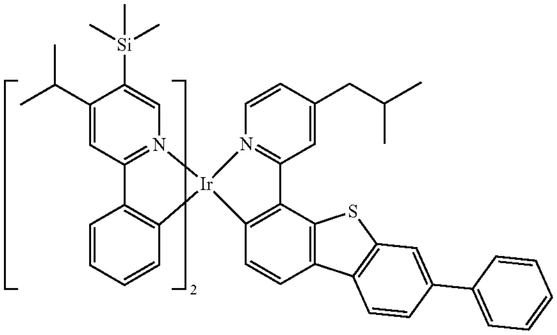
726
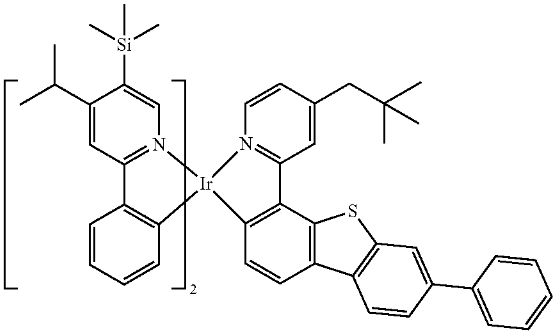

-continued
727
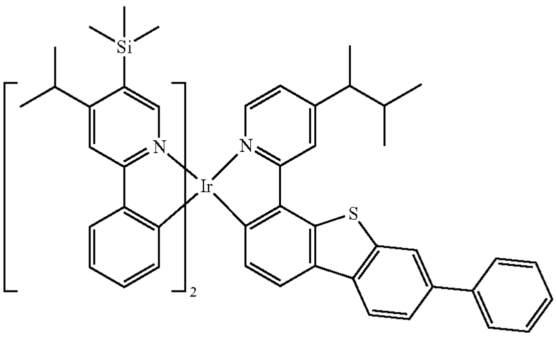
728
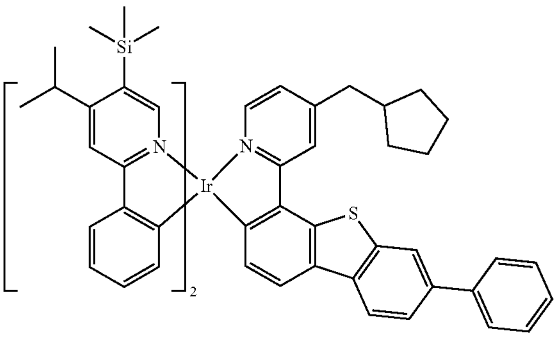
729
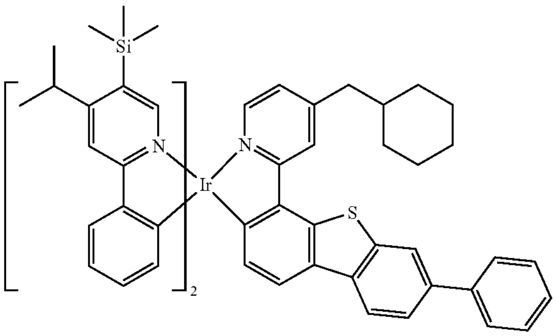
730
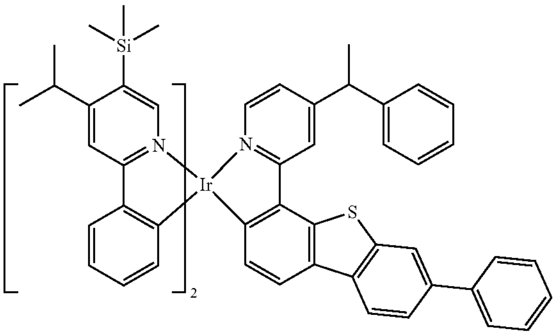
-continued
731
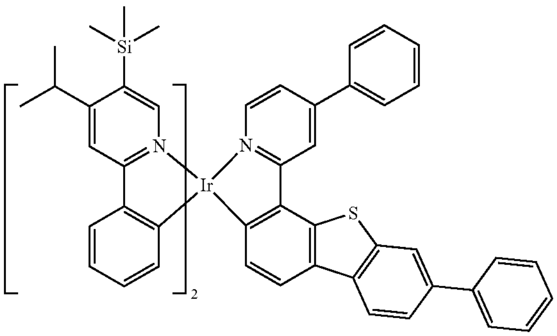
732
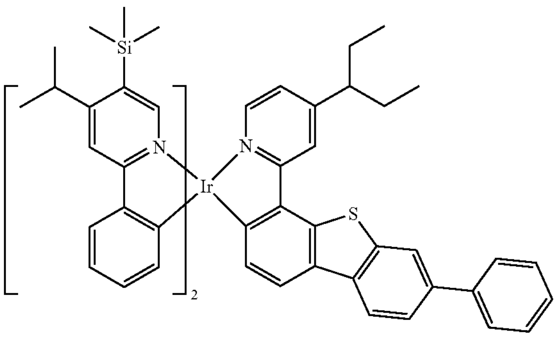
733
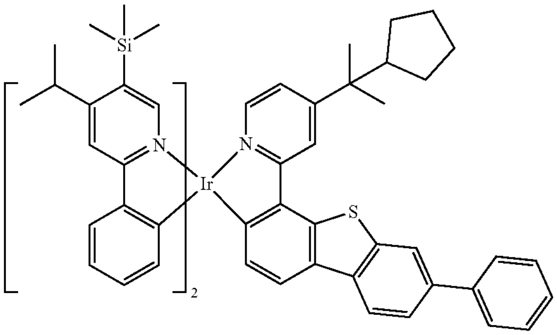
734
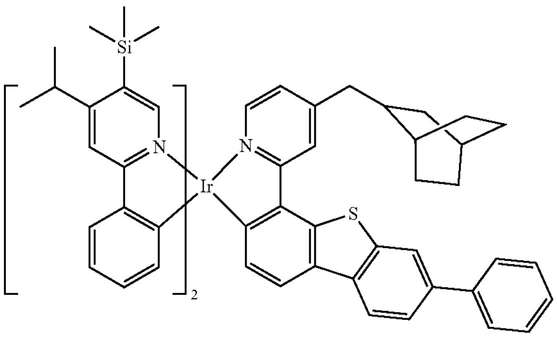

-continued
735
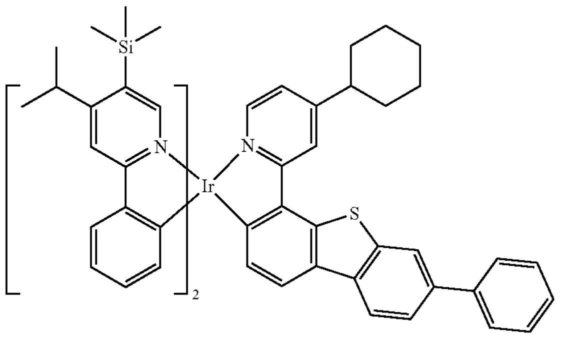
736
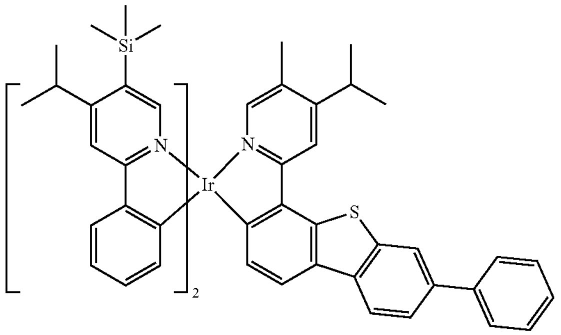
737
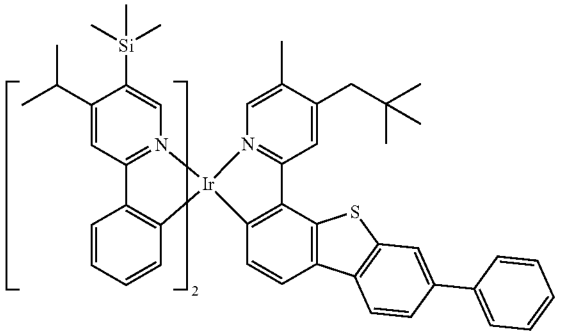
738
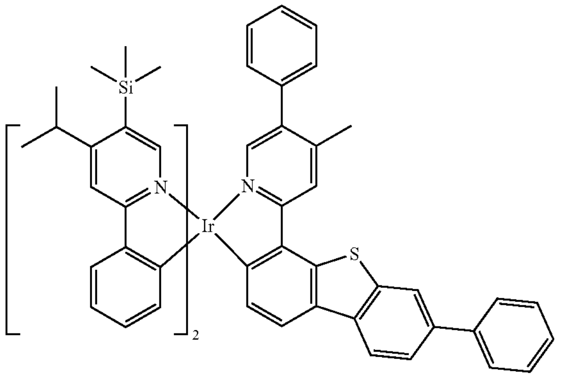
-continued
739
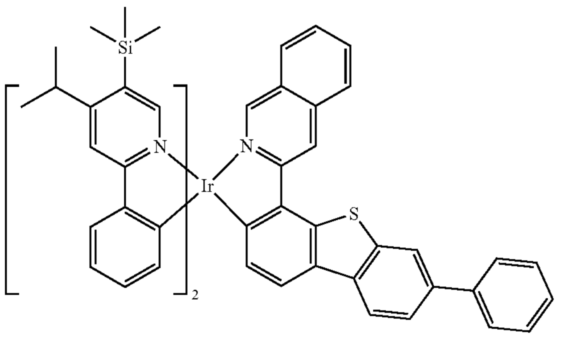
740
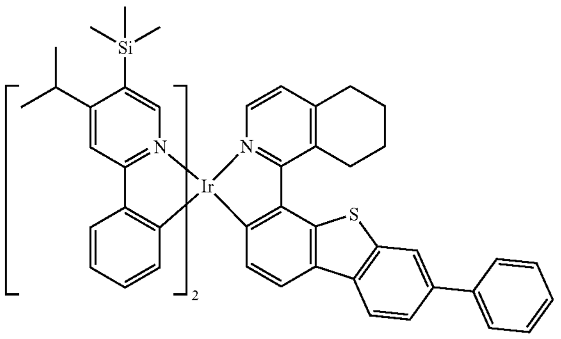
741
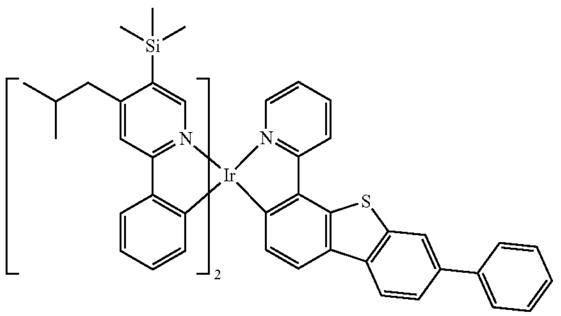
742
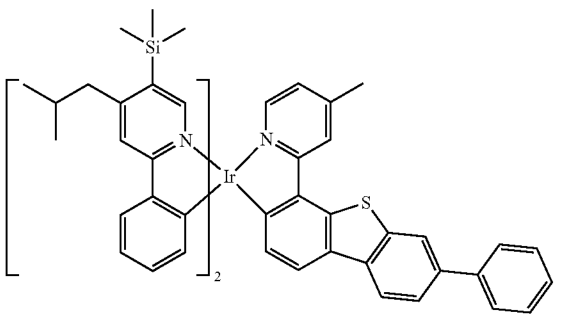

-continued
743
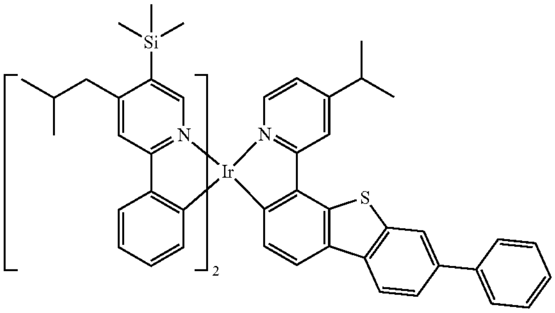
744
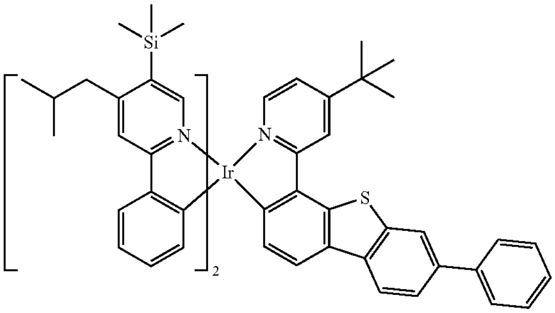
745
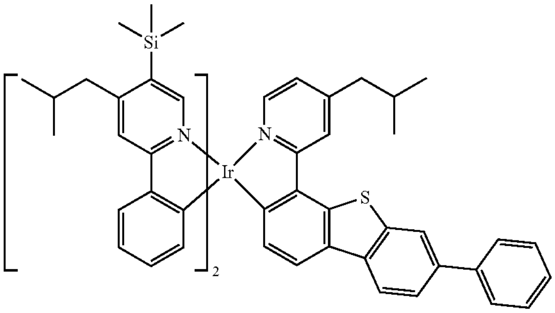
746
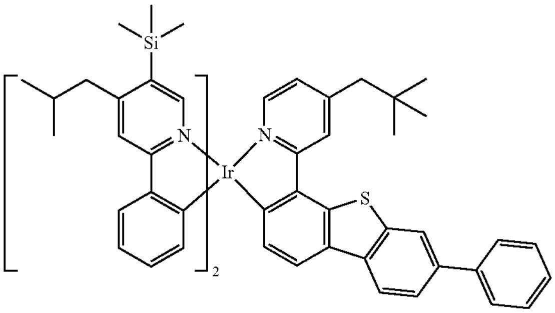
-continued
747
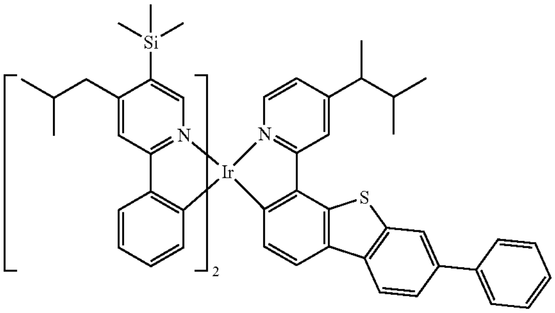
748
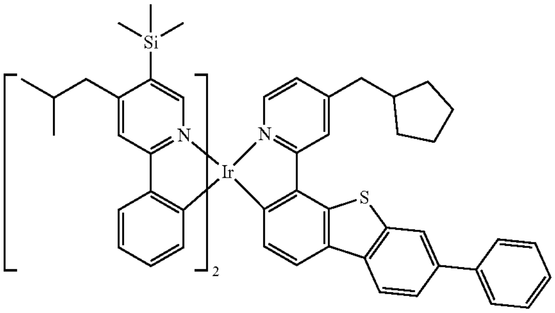
749
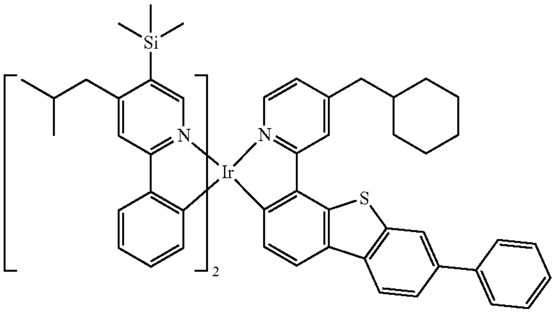
750
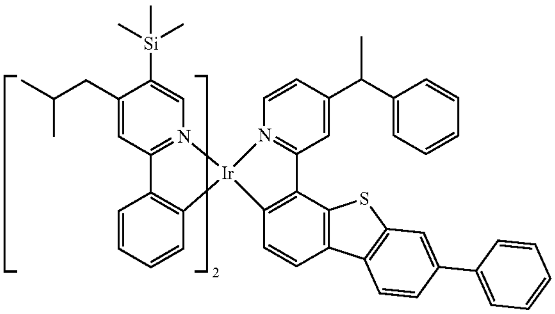

-continued
751
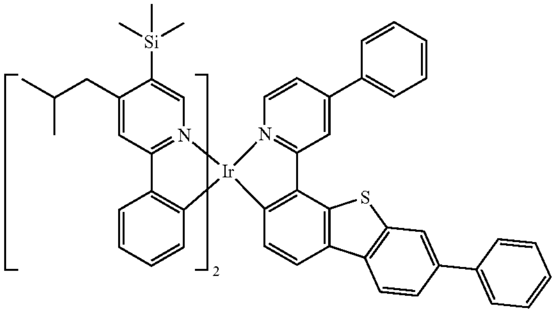
752
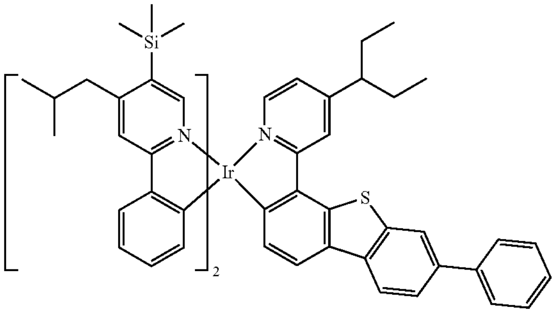
753
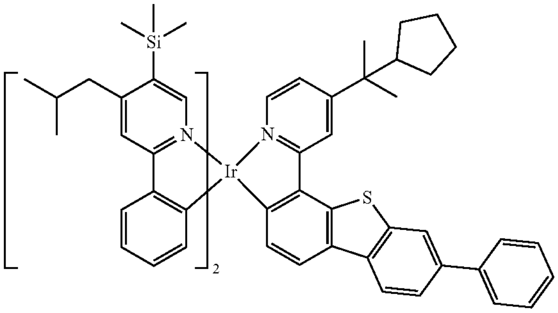
754
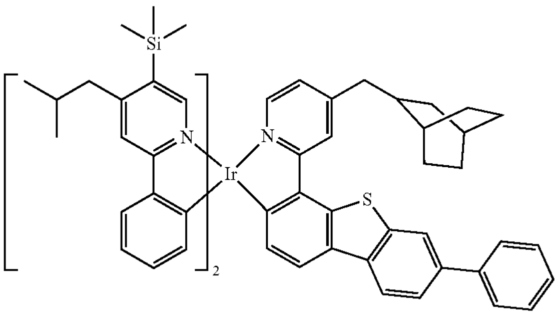
-continued
755
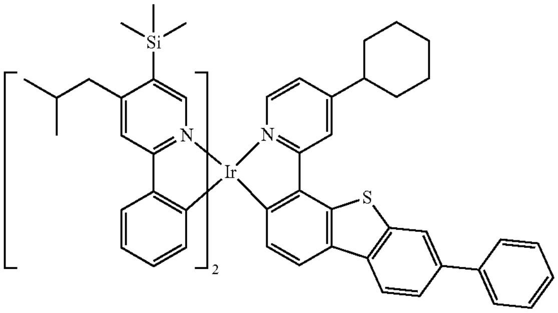
756
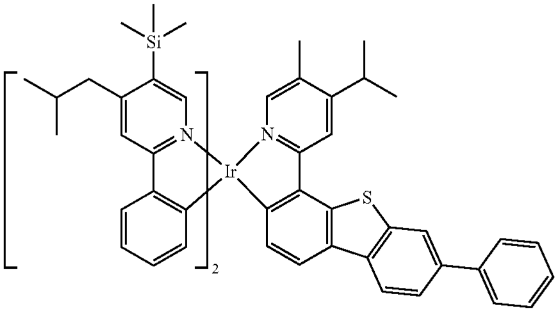
757
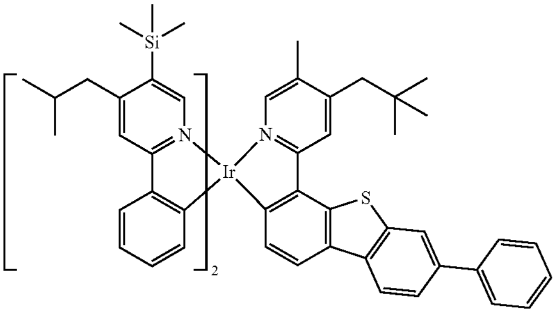
758
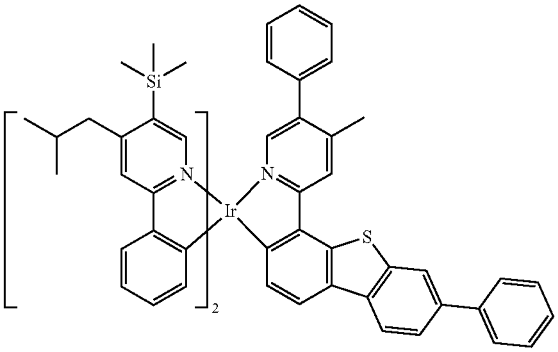

-continued
759
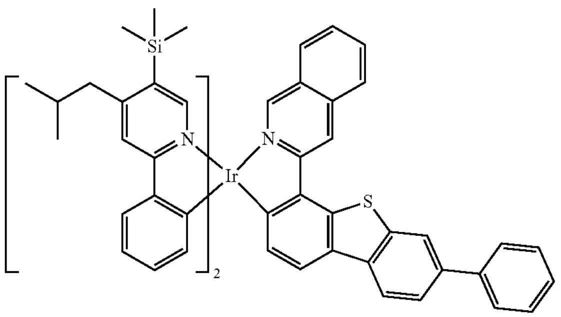
760
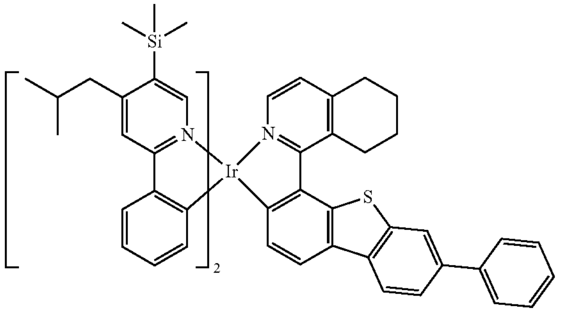
761
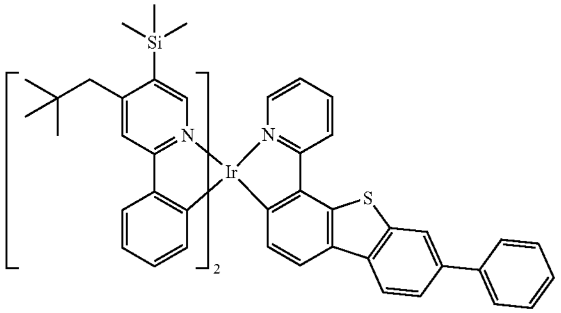
762
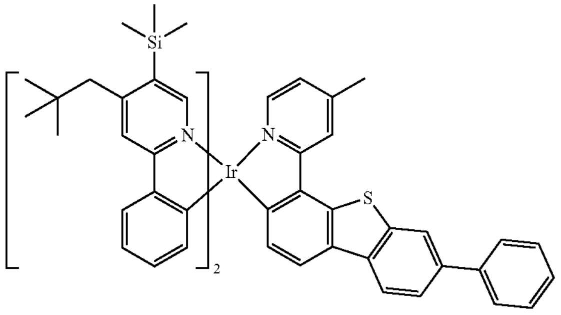
-continued
763
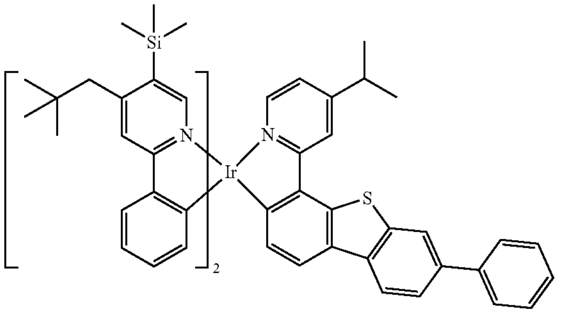
764
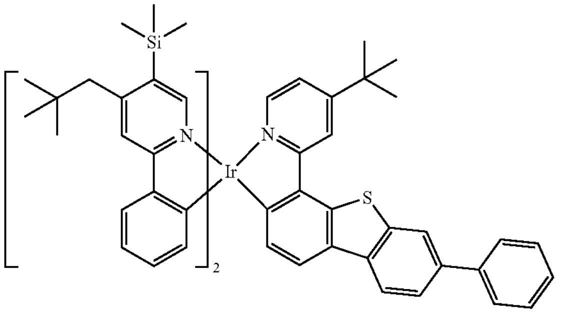
765
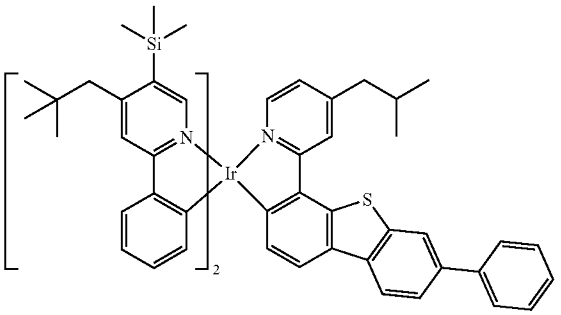
766
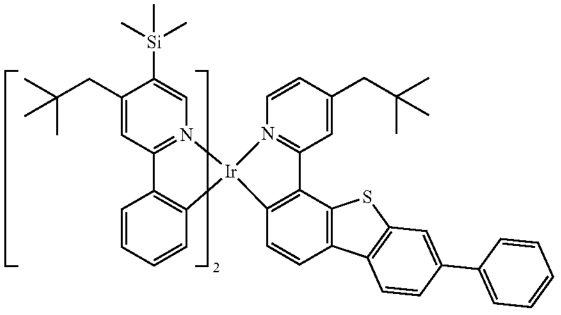

767
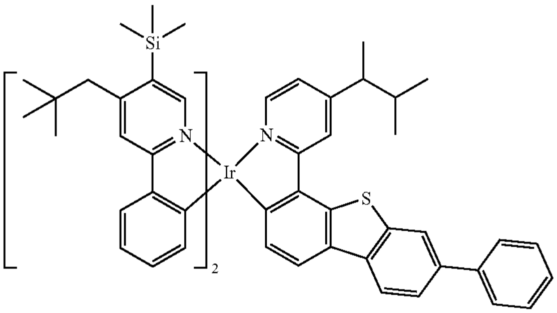
768
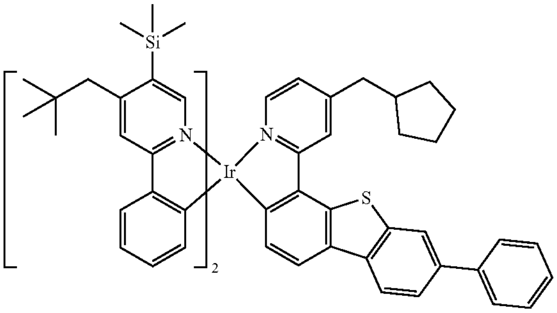
769
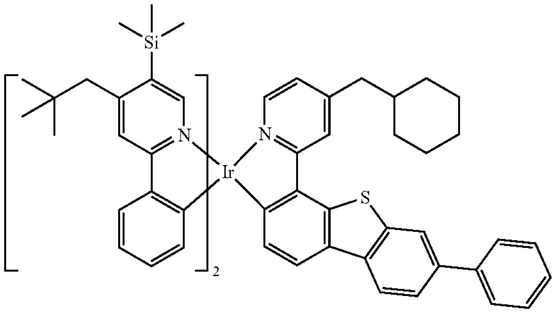
770
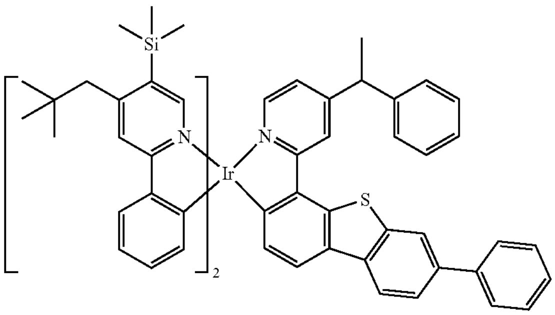
771
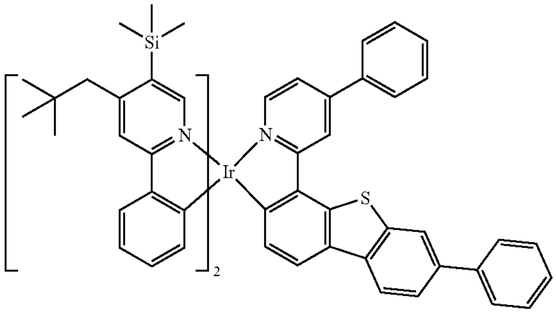
772
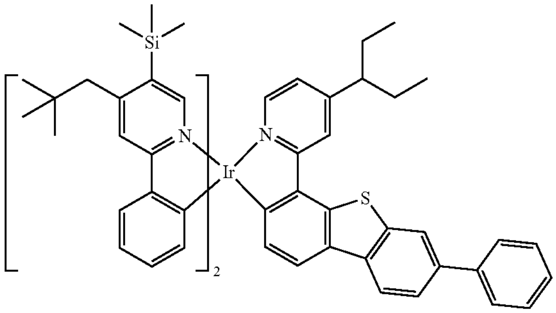
773
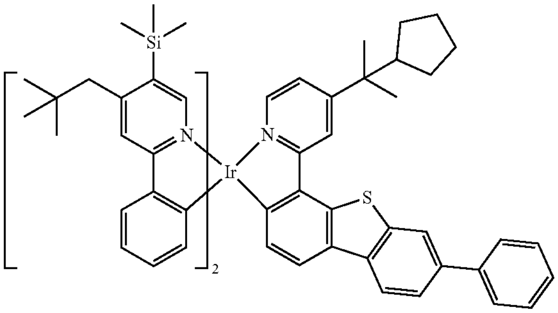
774
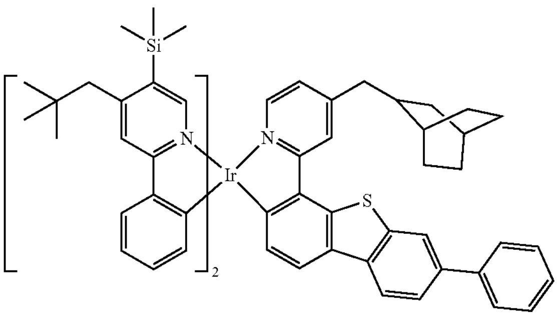

-continued
775
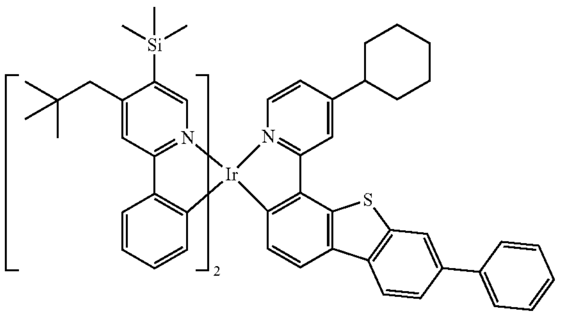
776
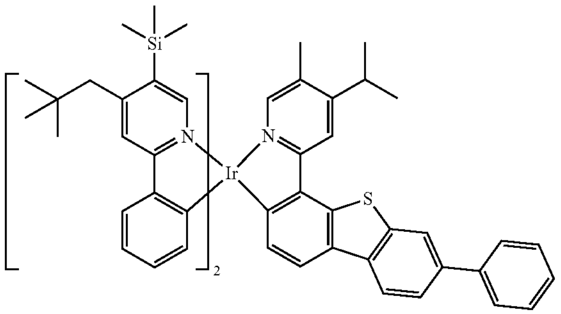
777
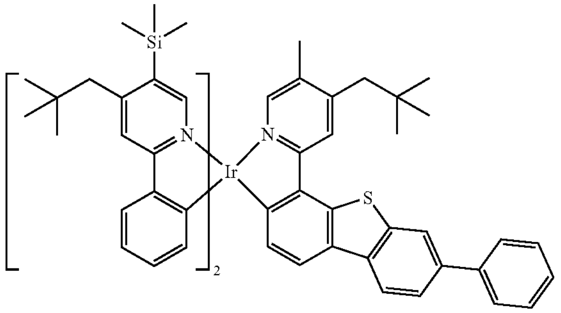
778
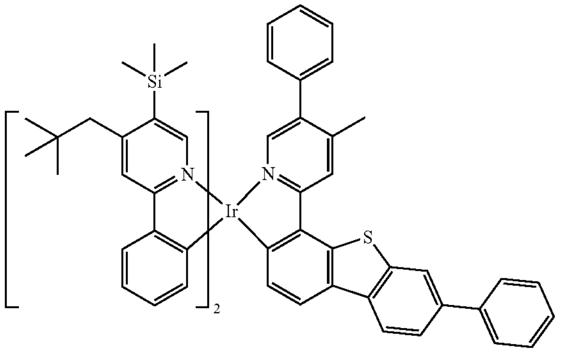
-continued
779
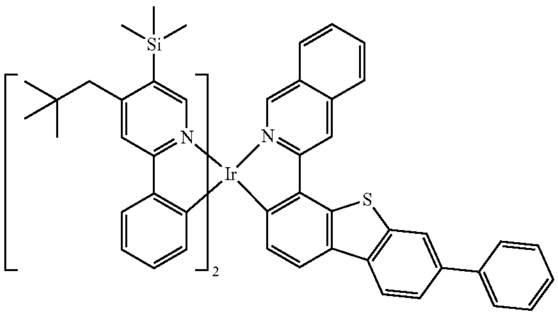
780
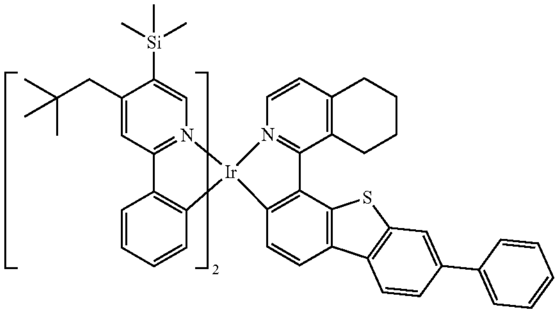
781
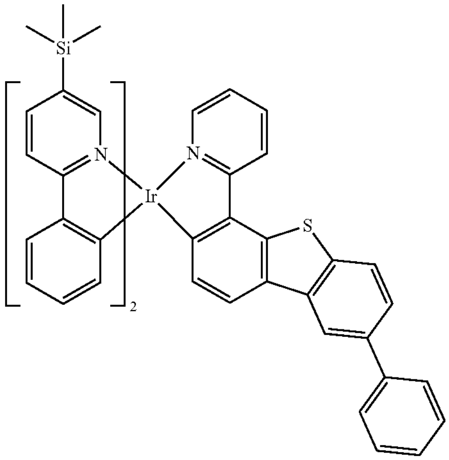
782
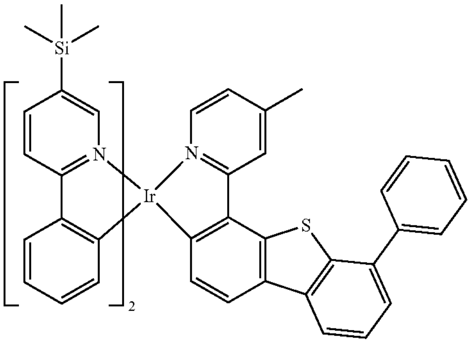

783
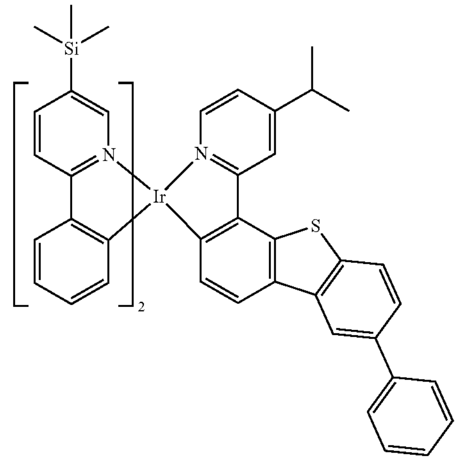
784
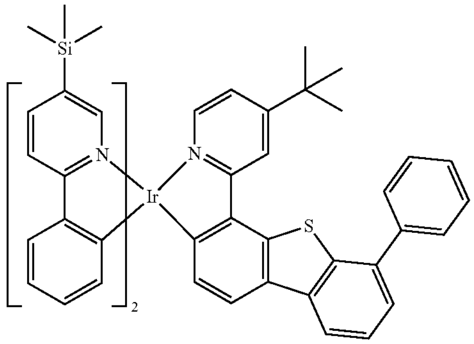
785
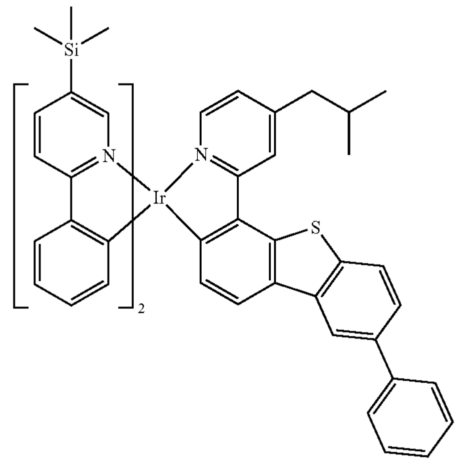
786
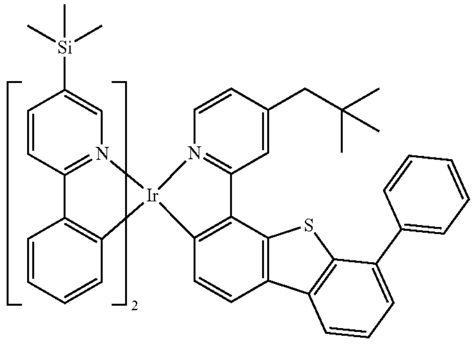
787
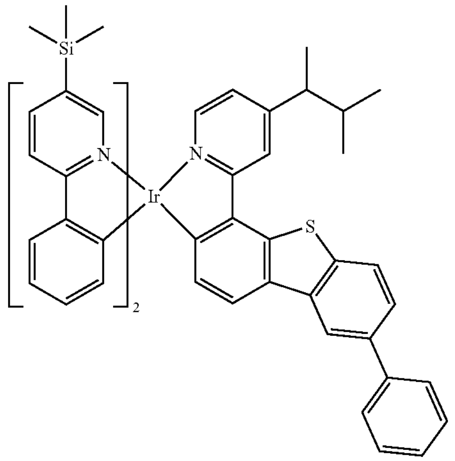
788
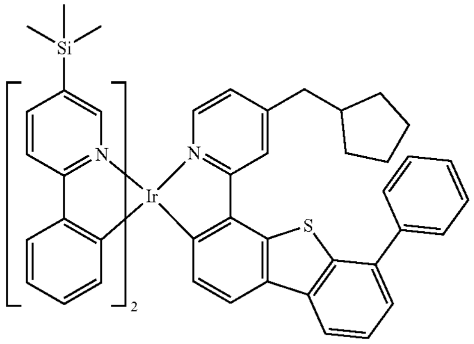
789
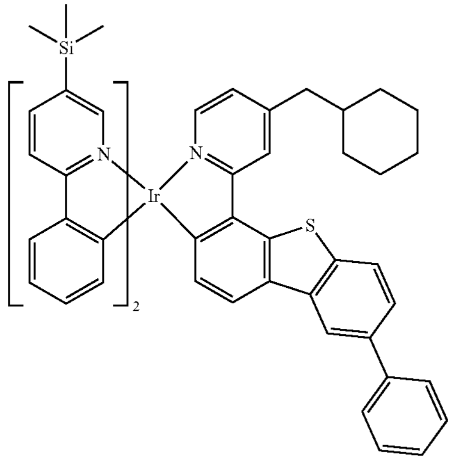
790
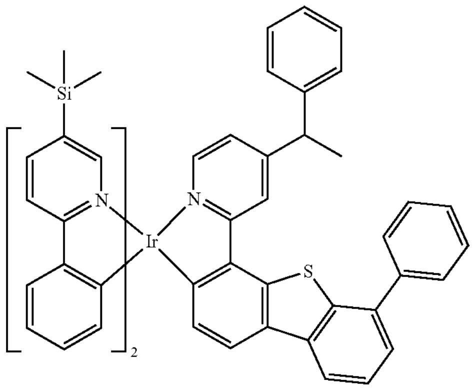

791
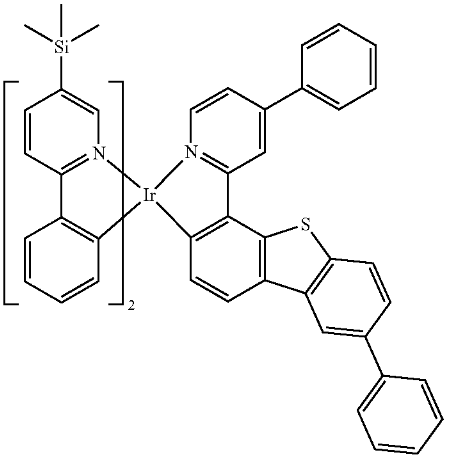
792
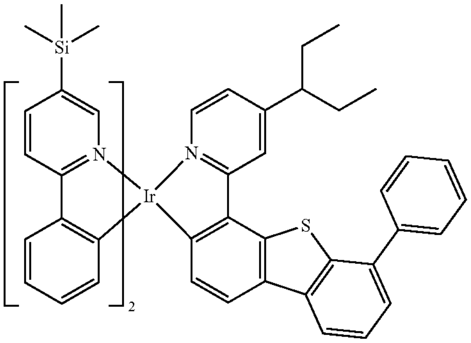
793
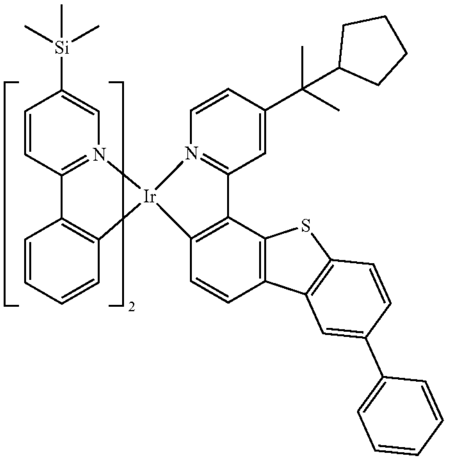
794
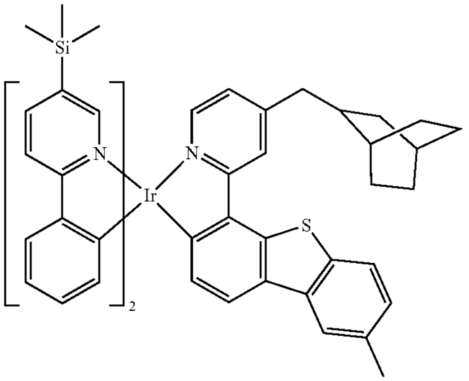
795
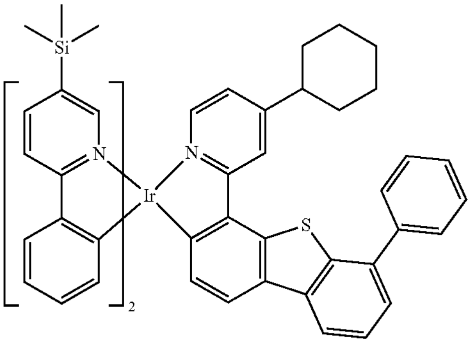
796
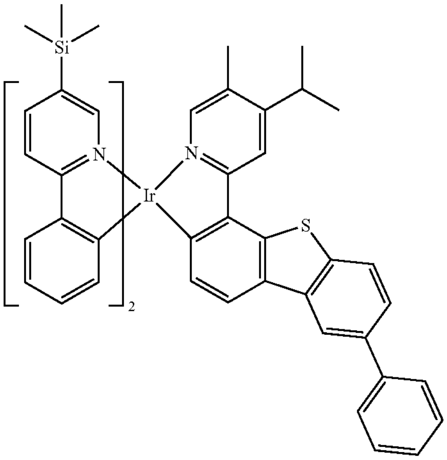
797
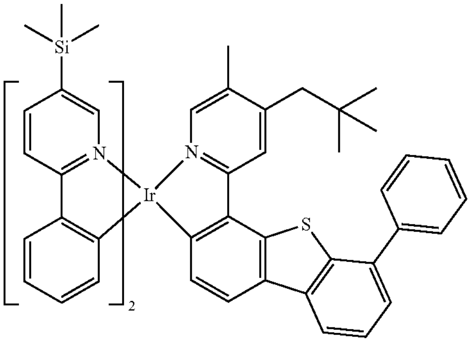

-continued
798
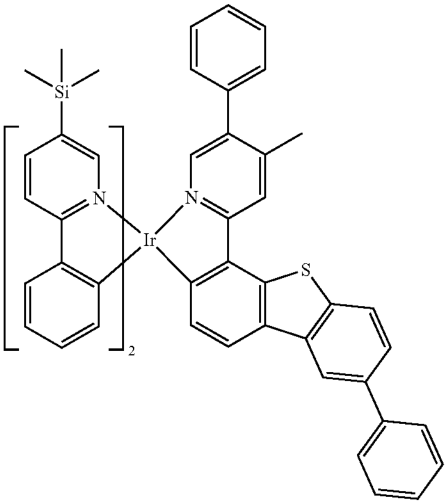
799
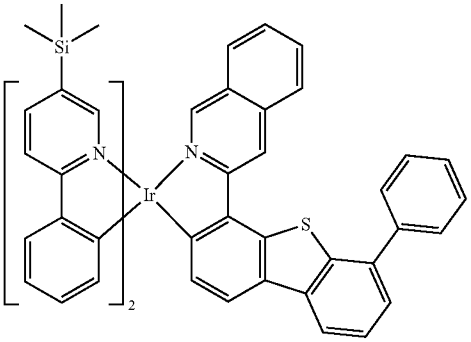
800
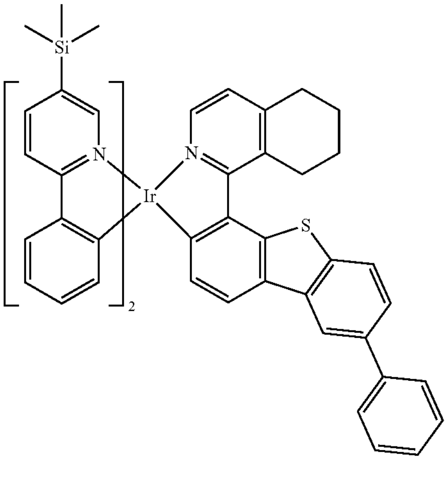
-continued
801
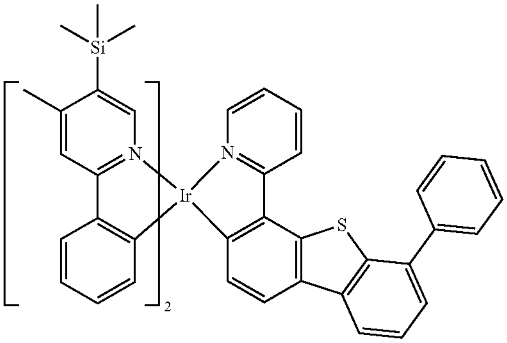
802
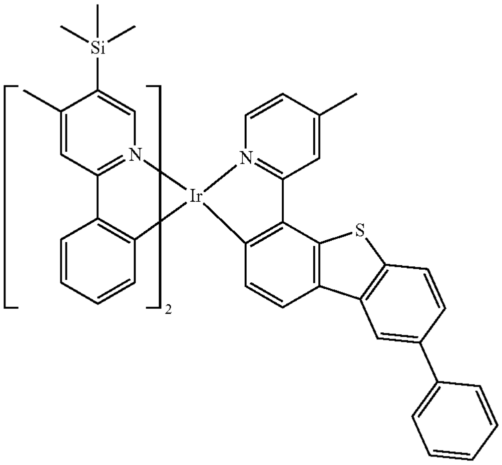
803
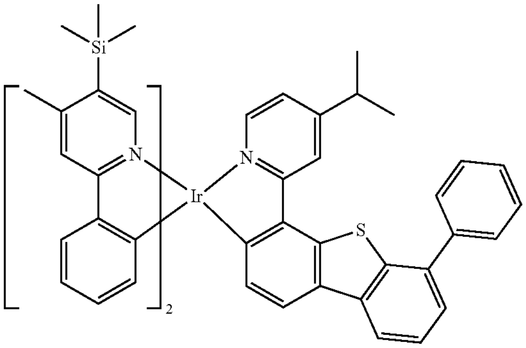

-continued
804
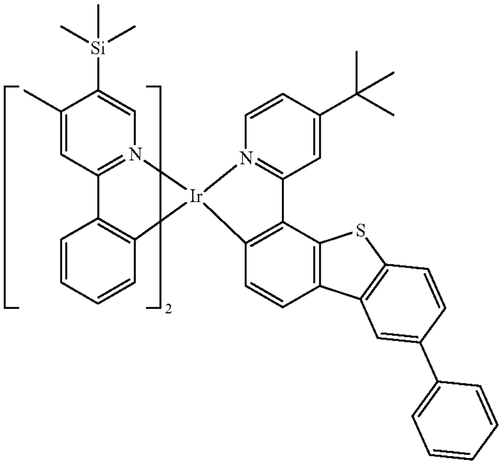
805
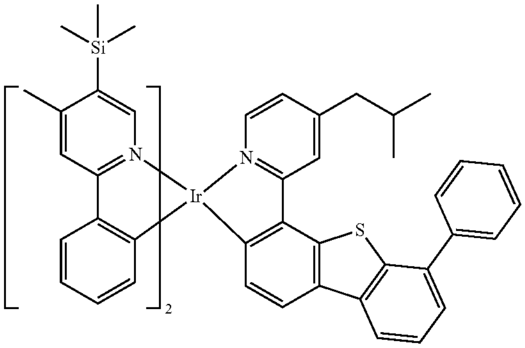
806
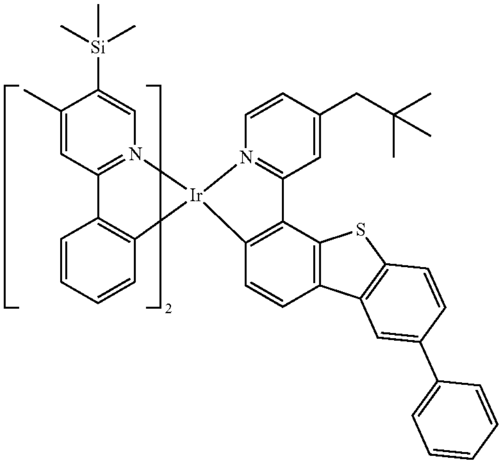
807
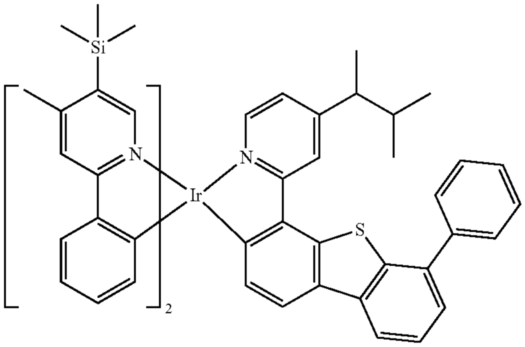
-continued
808
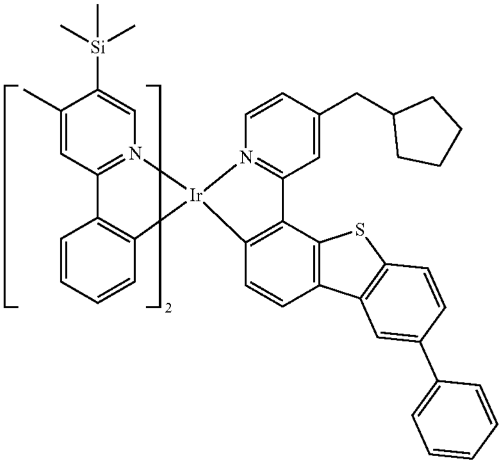
809
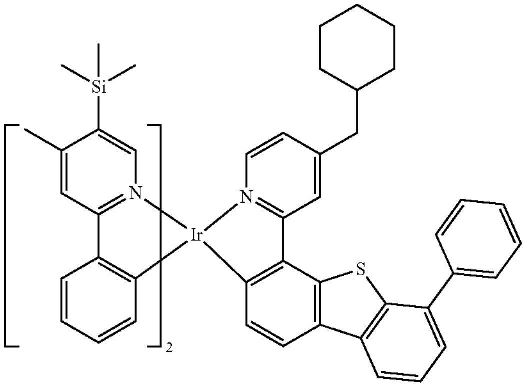
810
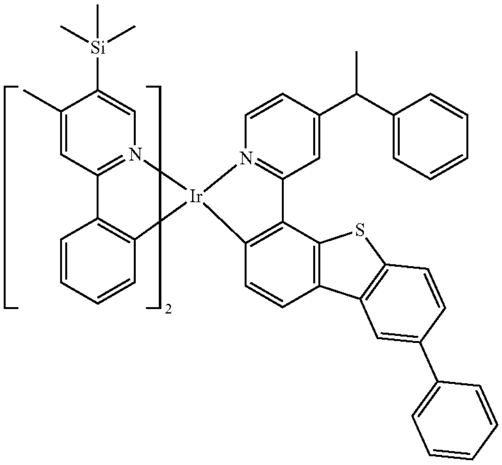

-continued
811
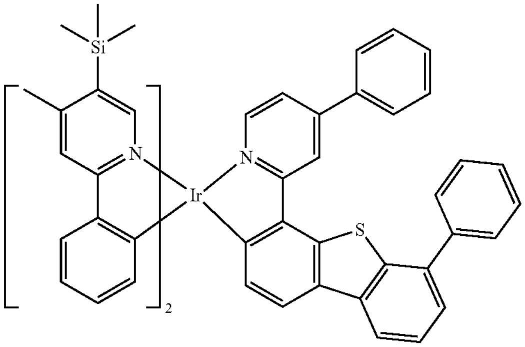
812
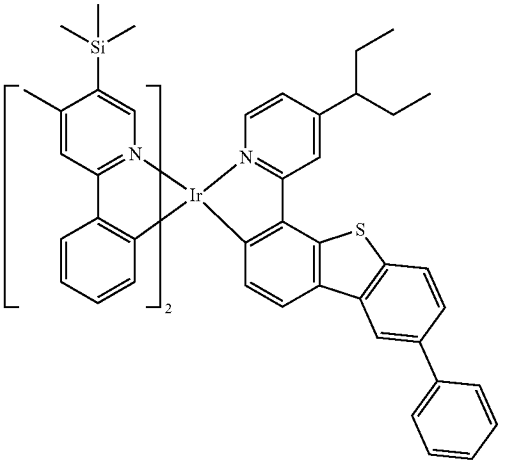
813
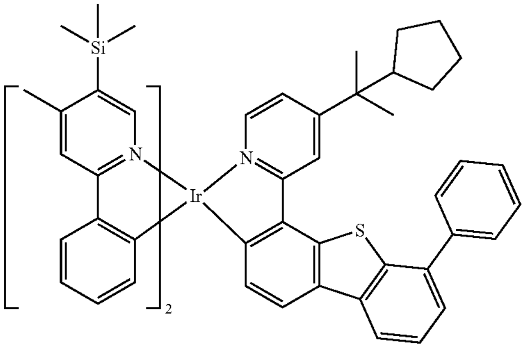
814
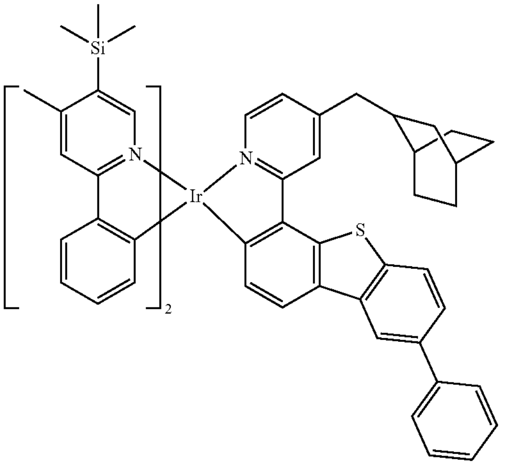
-continued
815
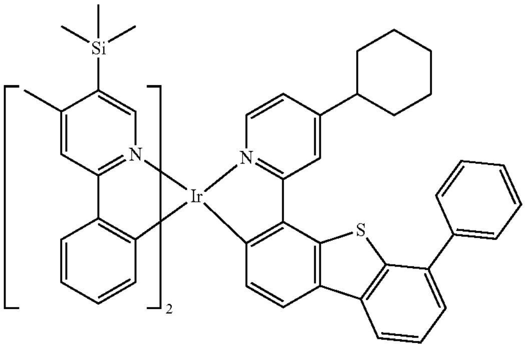
816
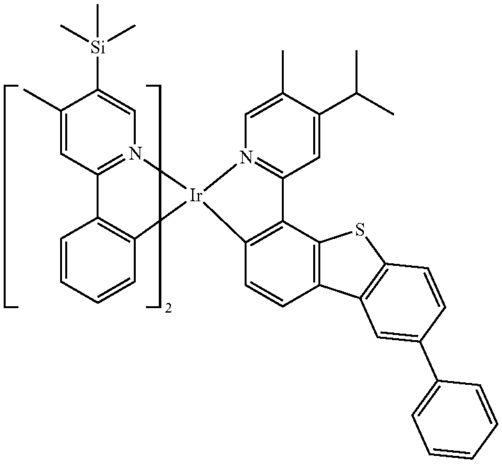
817
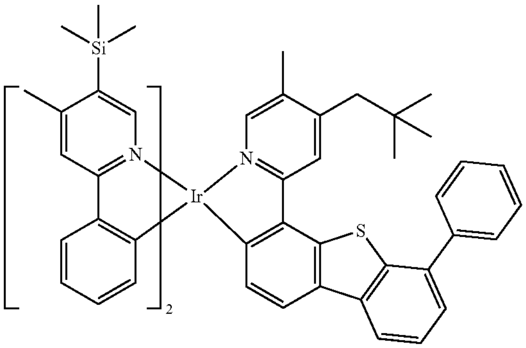

818
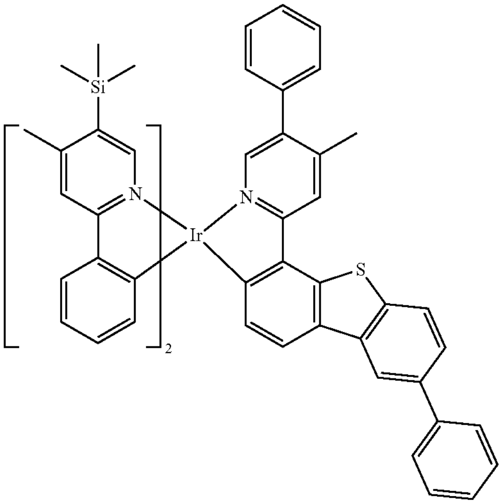
819
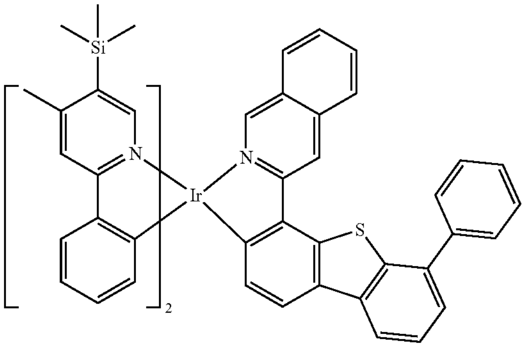
820
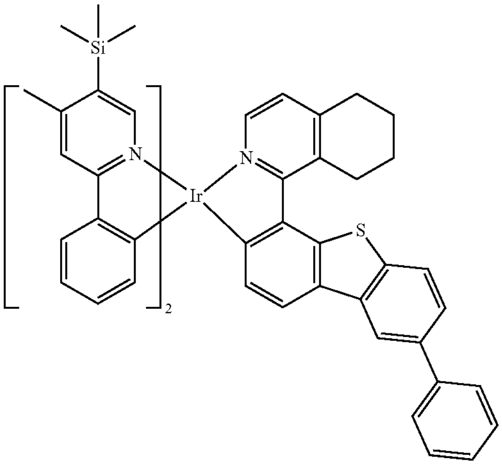
821
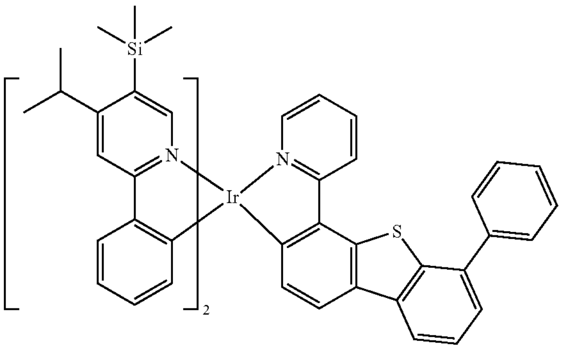
822
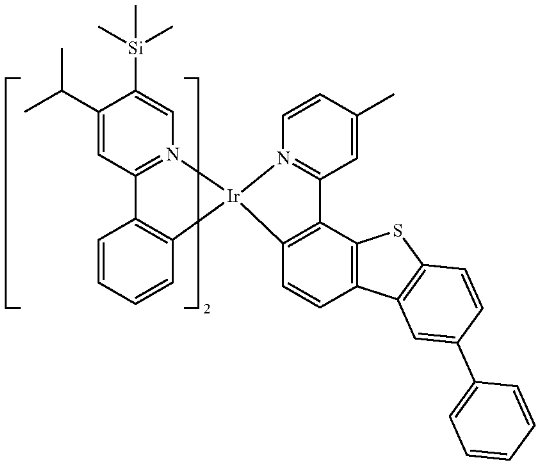
823
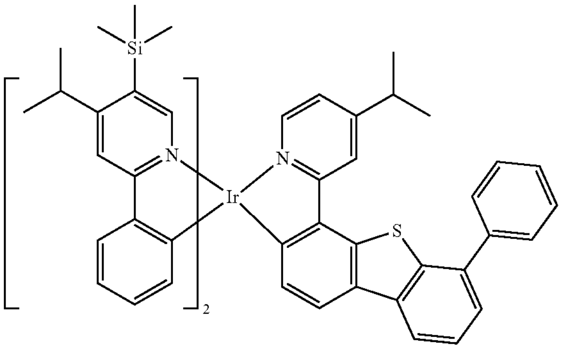

824
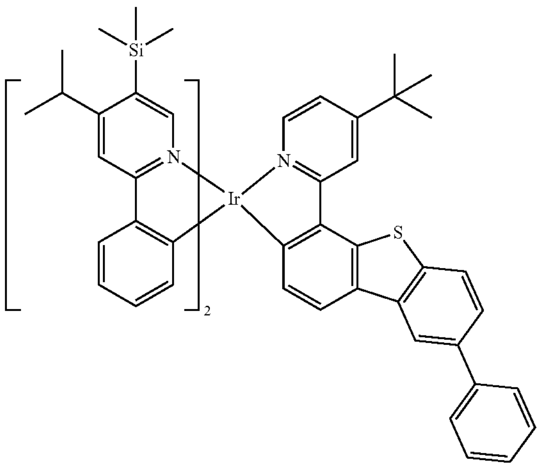
825
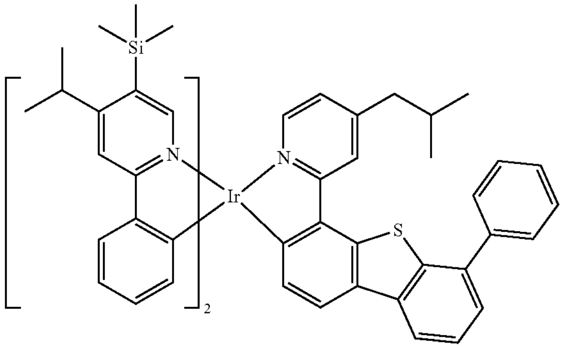
826
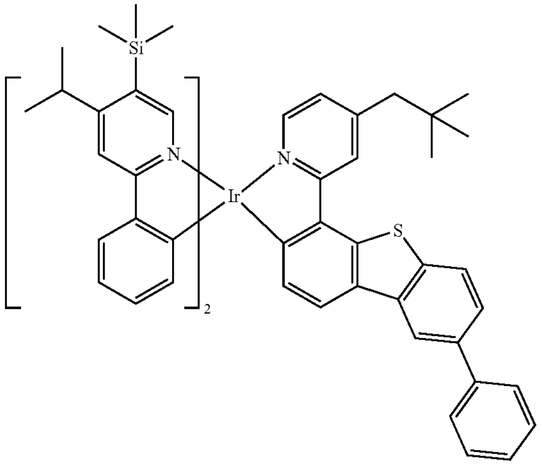
-continued
827
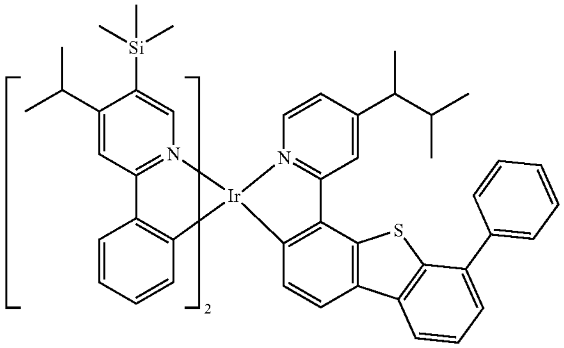
828
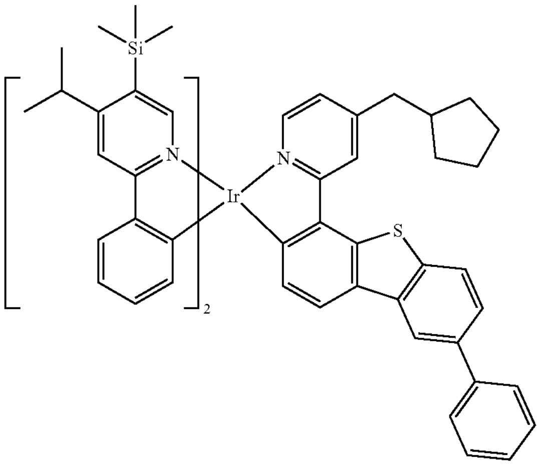
829
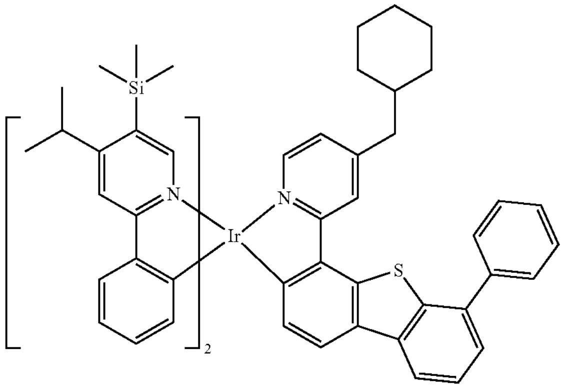

830
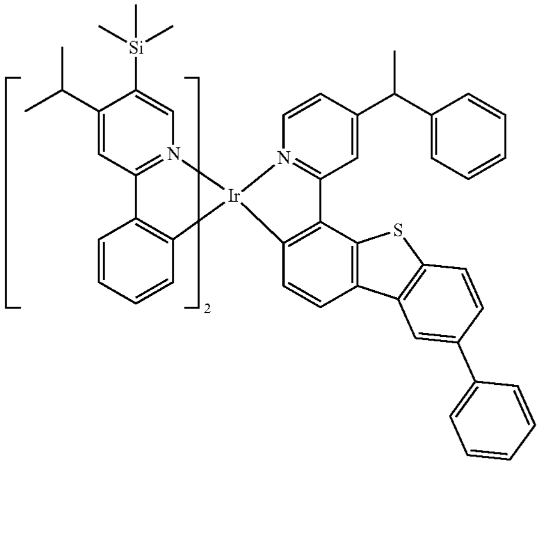
831
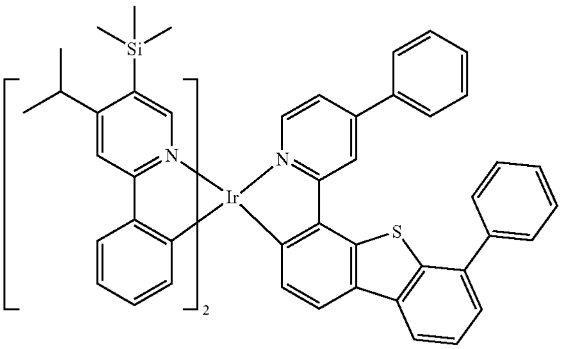
832
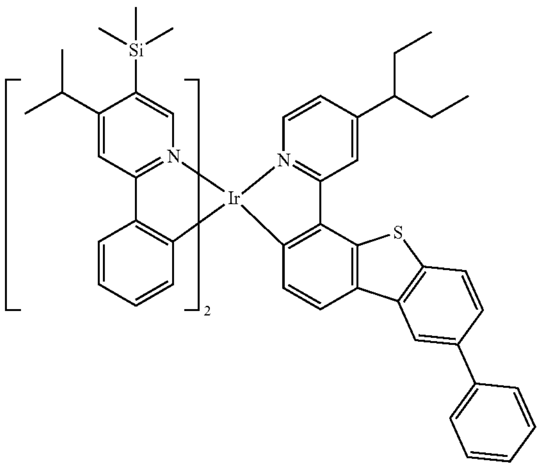
833
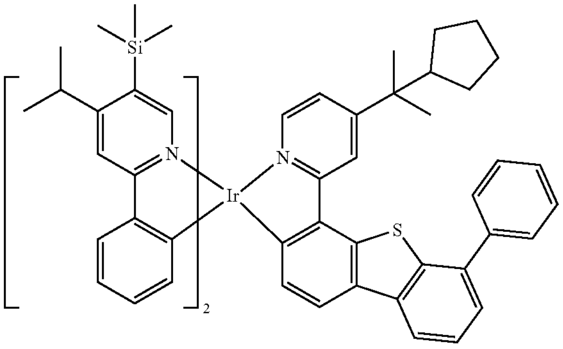
834
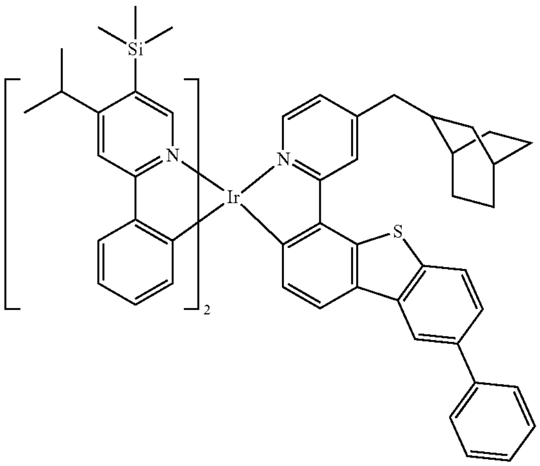
835
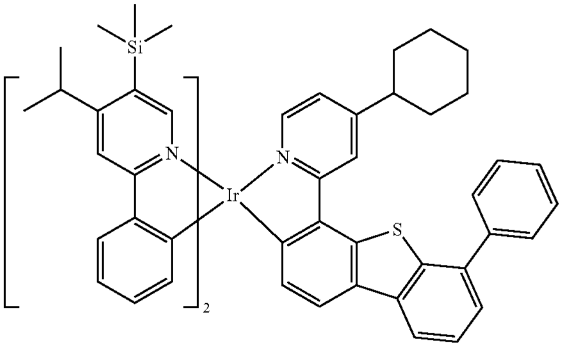

-continued
836
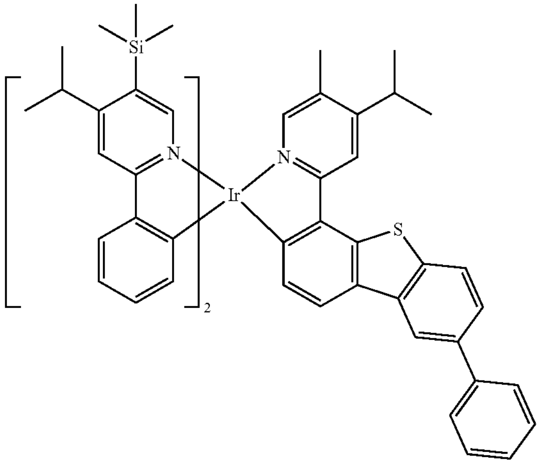
837
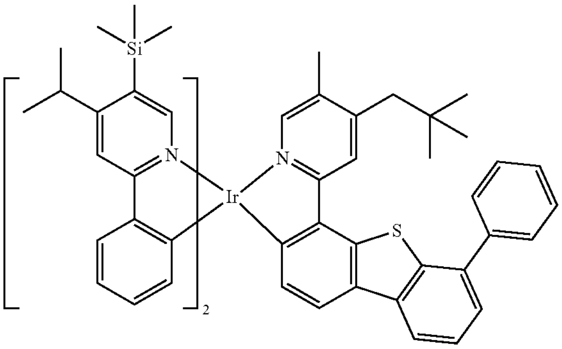
838
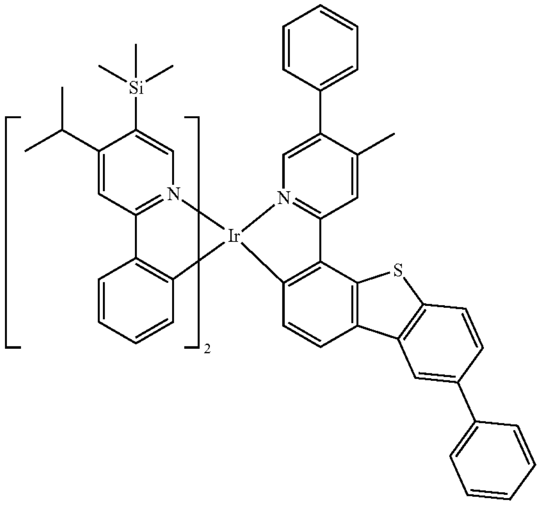
-continued
839
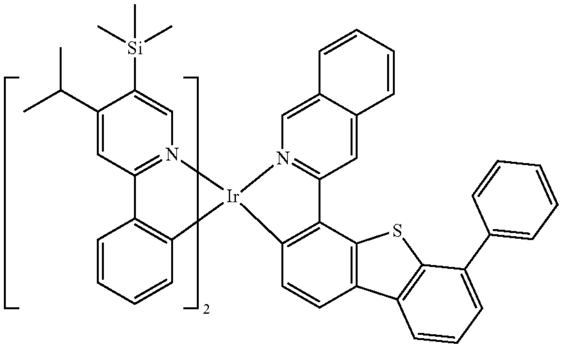
840
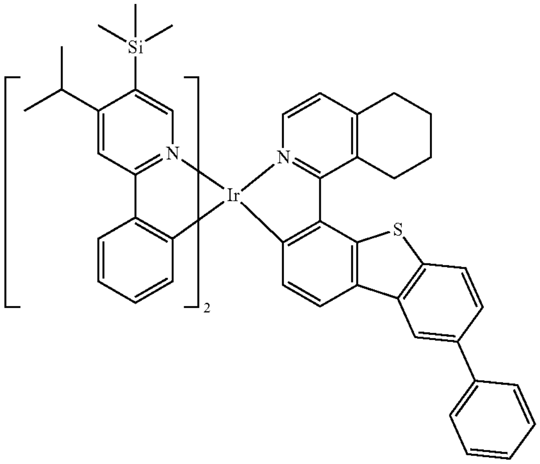
841
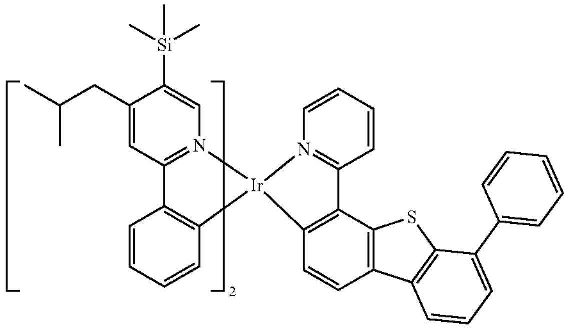

-continued
842
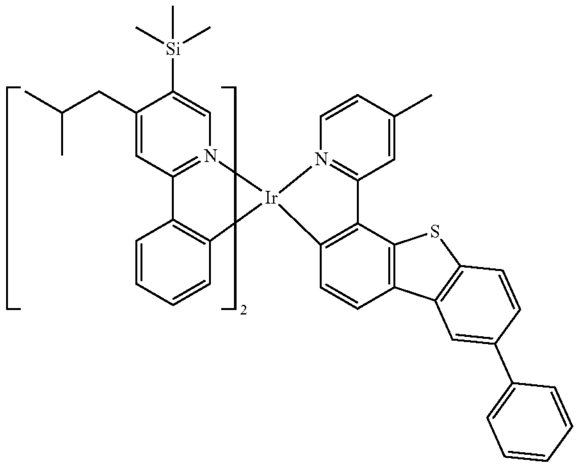
843
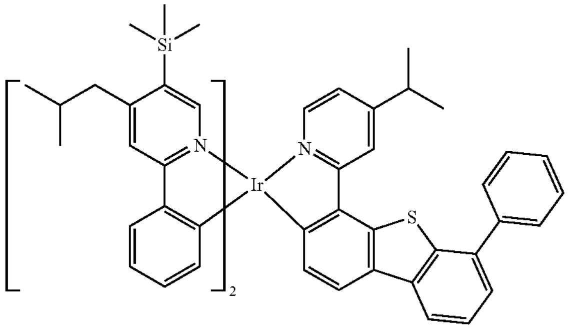
844
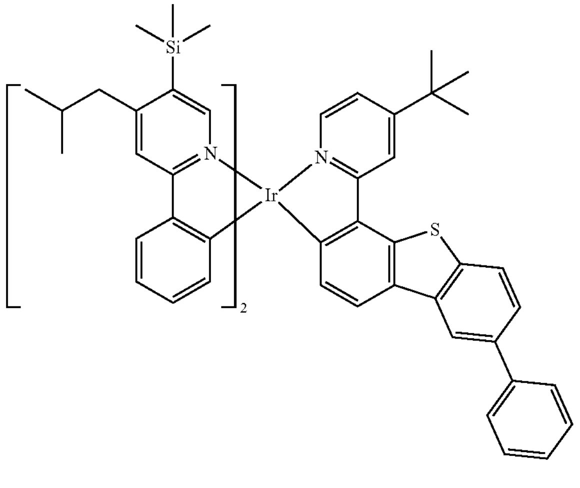
845
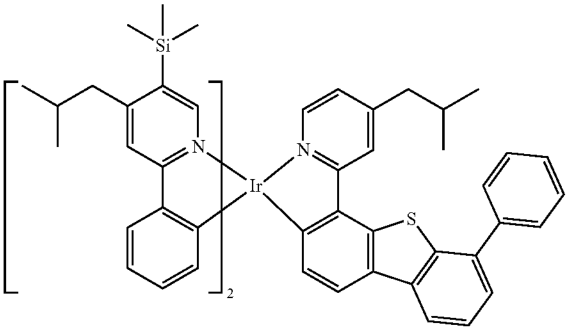
846
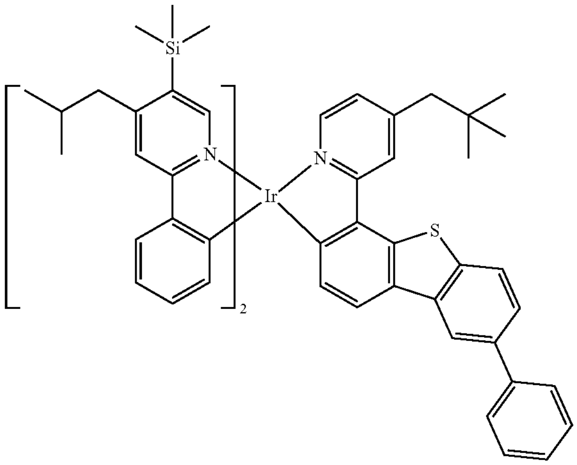
847
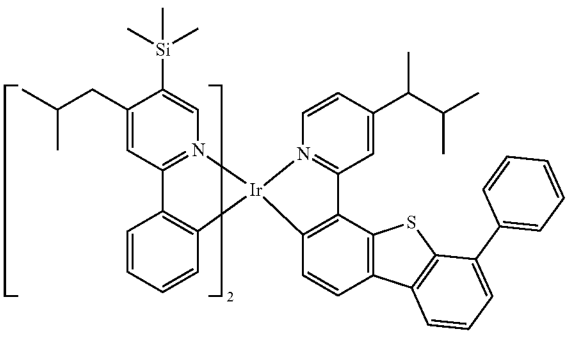

-continued
848
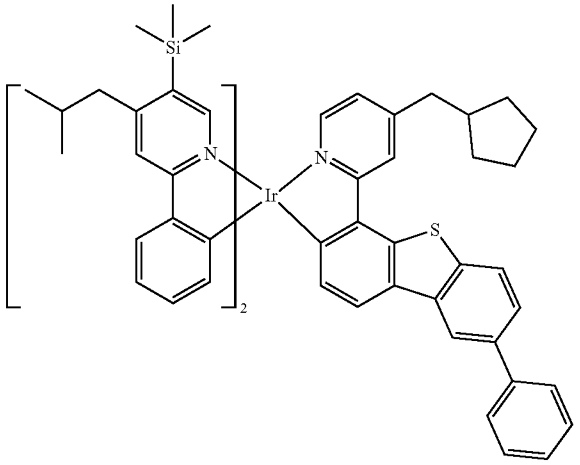
849
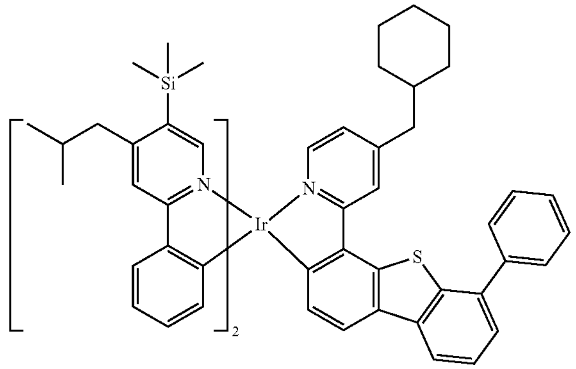
850
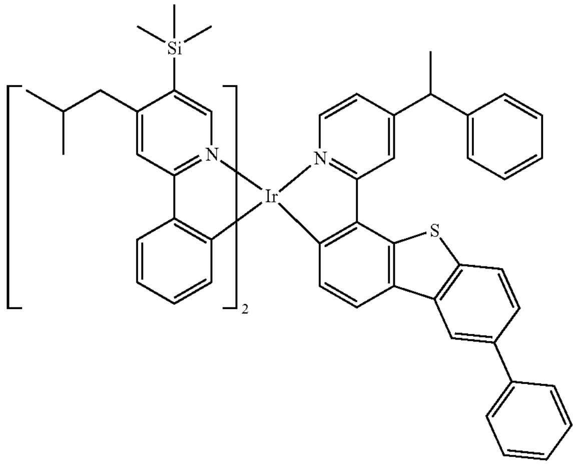
-continued
851
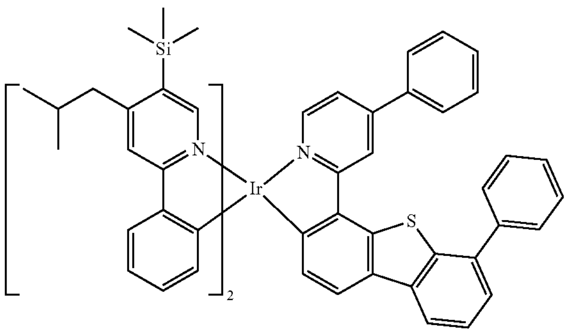
852
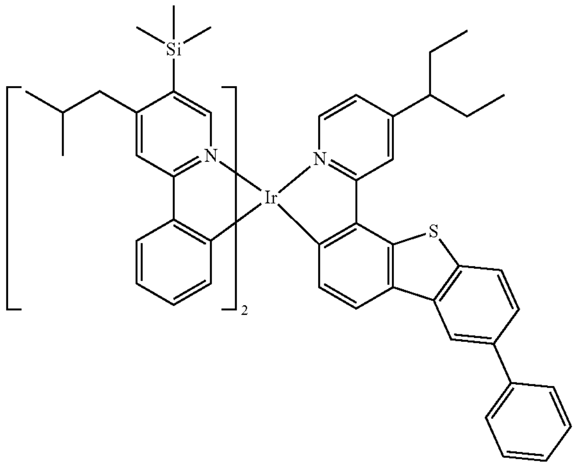
853
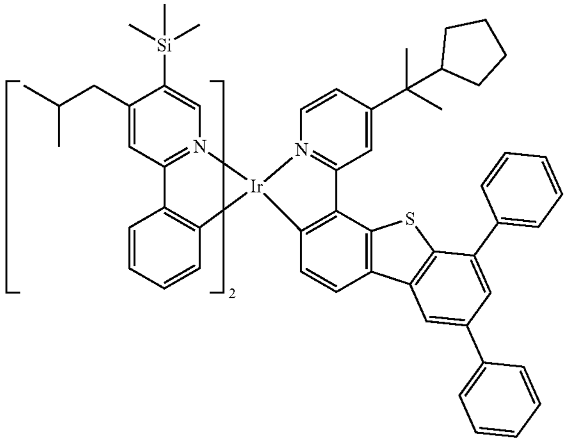

-continued
854
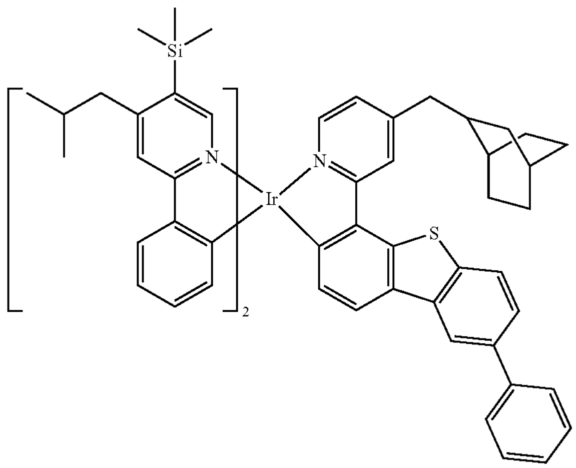
855
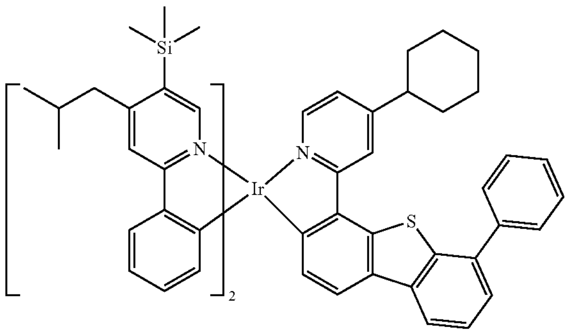
856
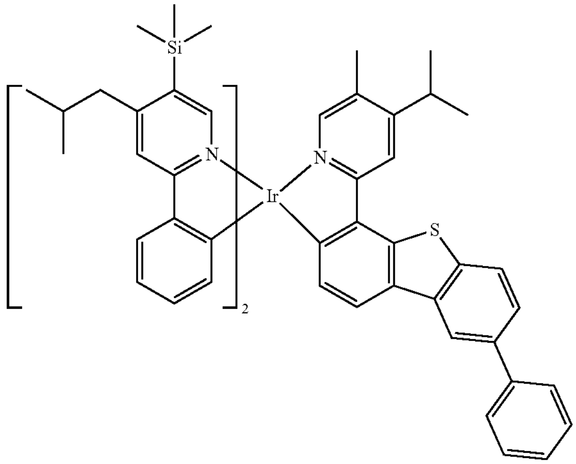
-continued
857
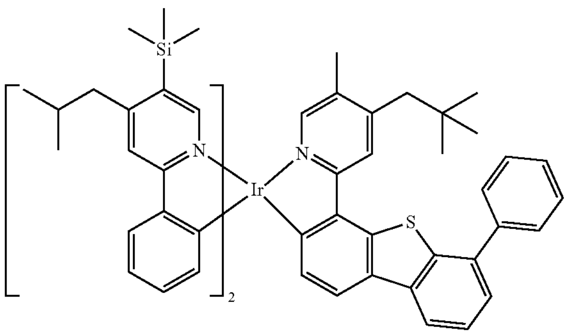
858
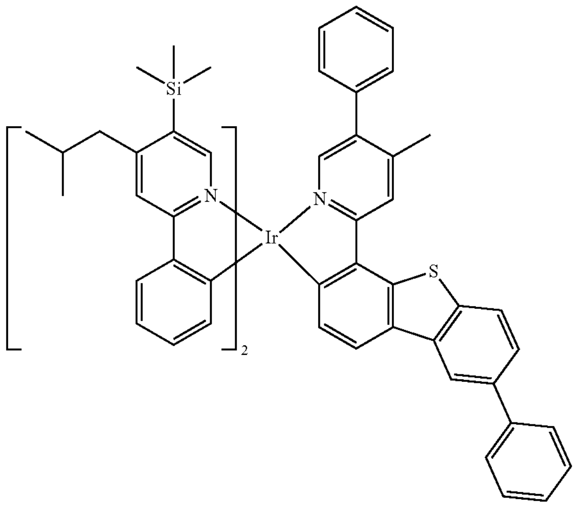
859
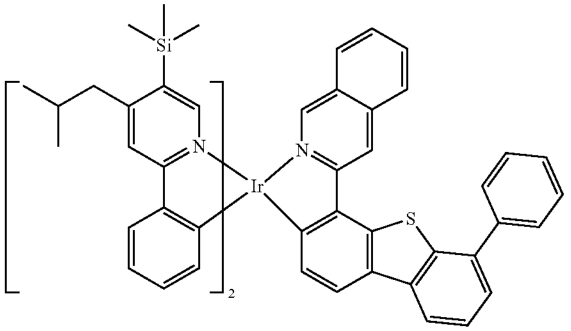

-continued
860
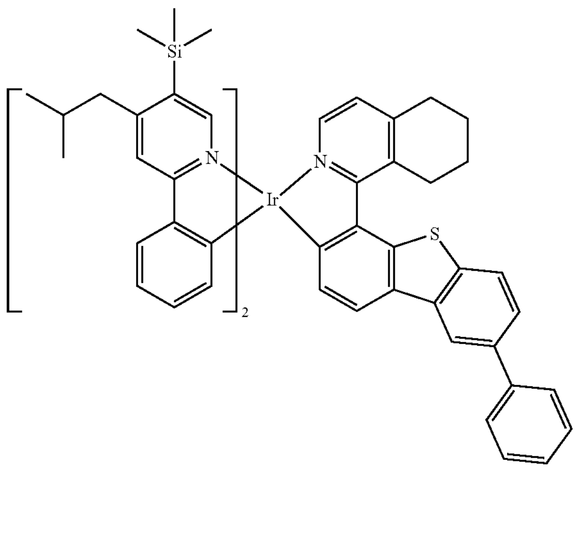
861
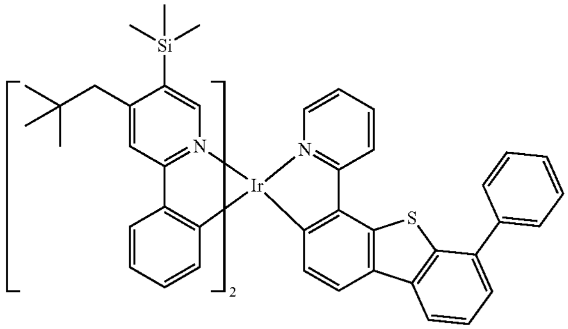
862
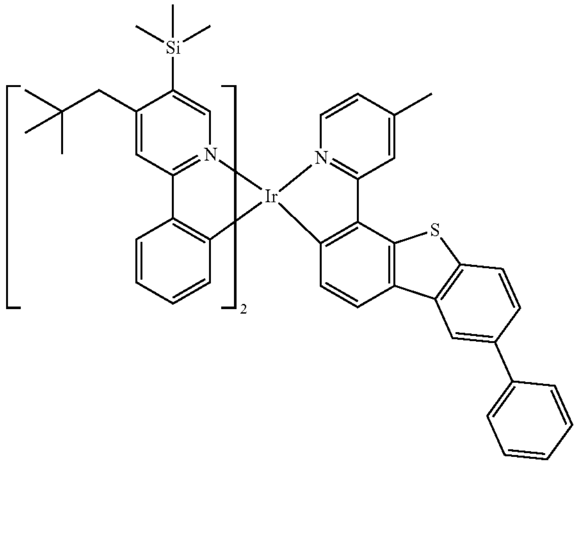
-continued
863
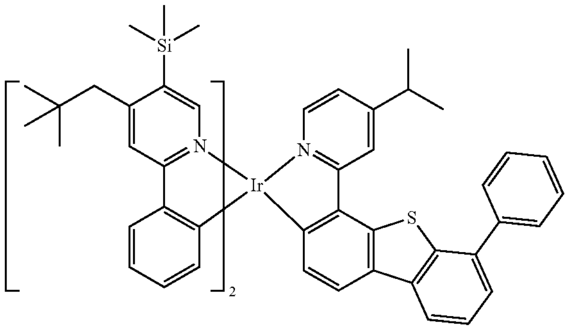
864
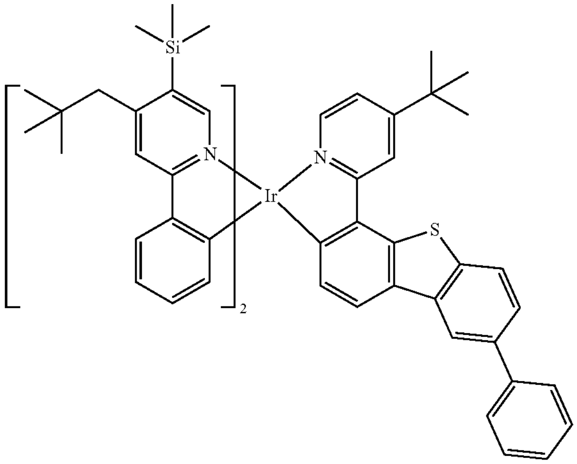
865
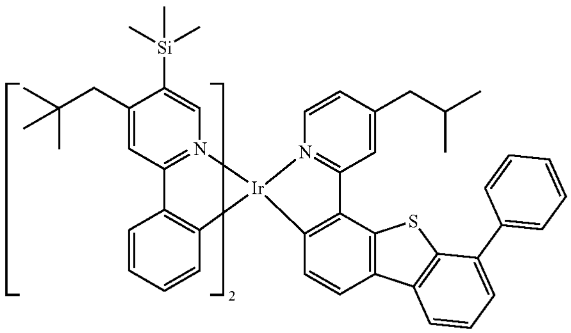

866
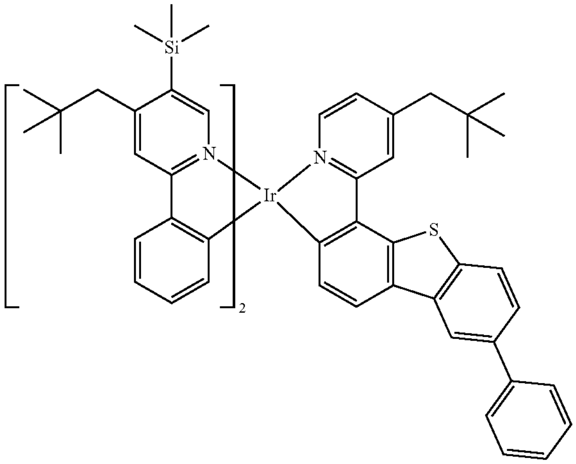
867
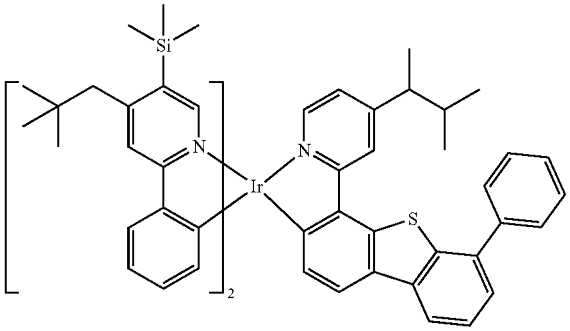
868
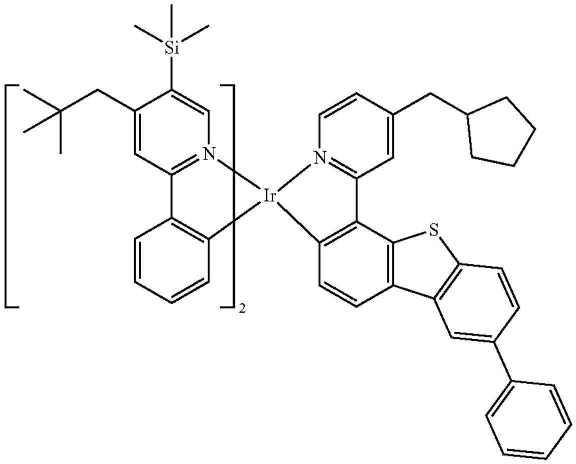
869
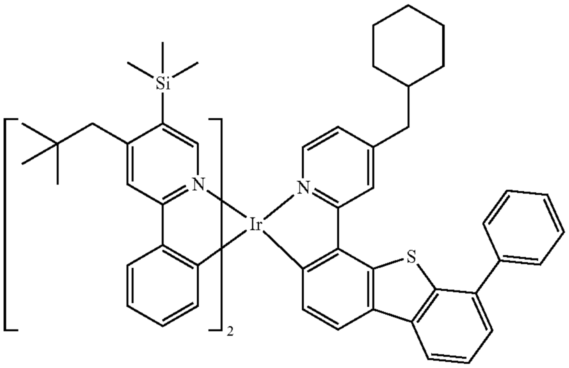
870
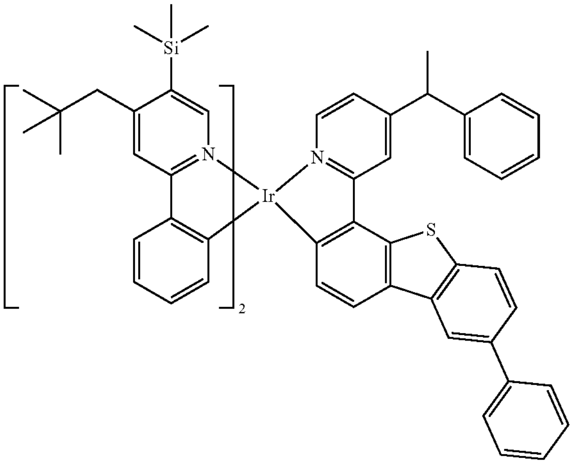
871
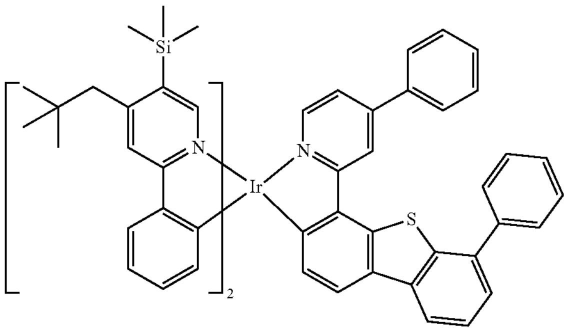

-continued
872
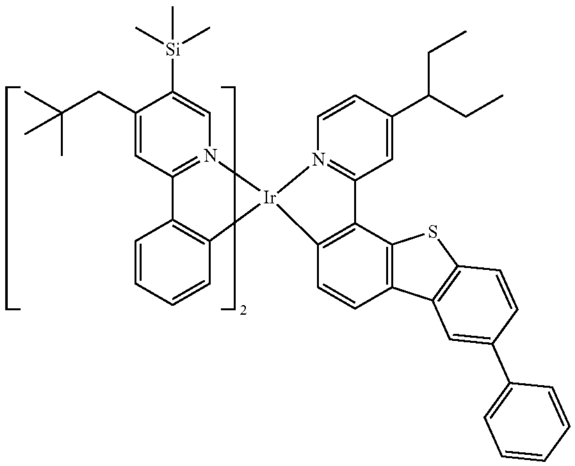
873
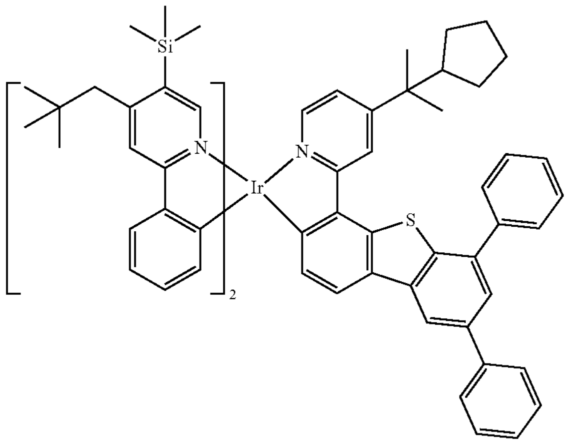
874
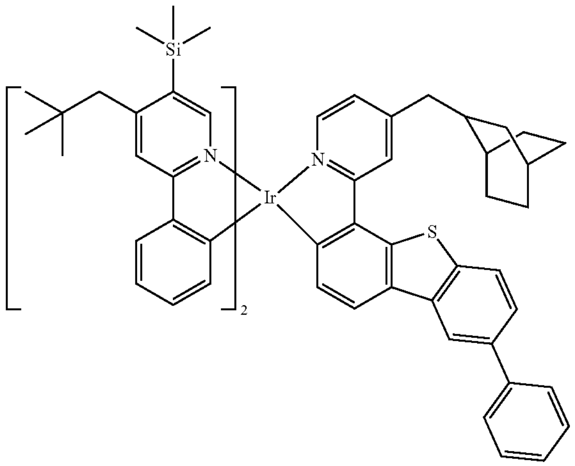
-continued
875
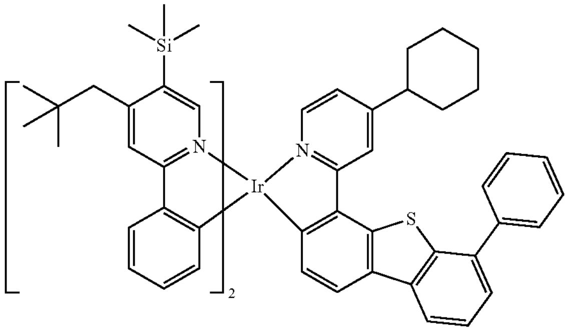
876
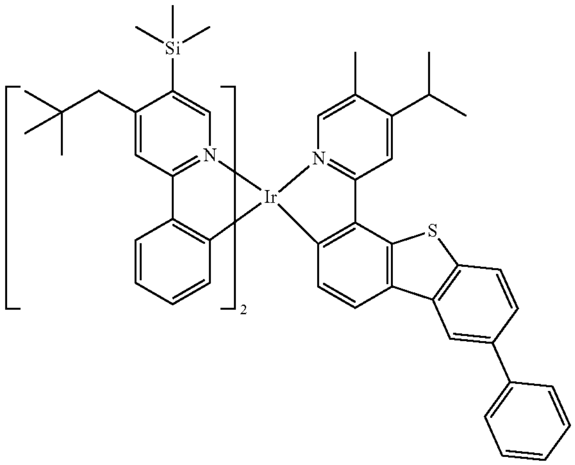
877
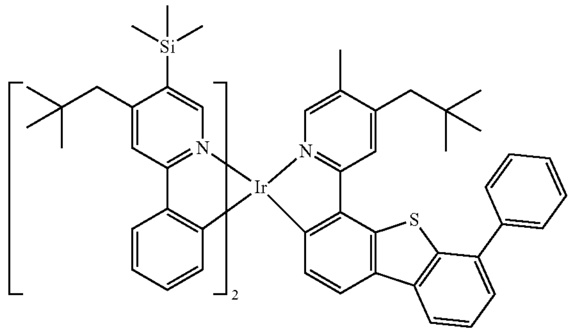

-continued
878
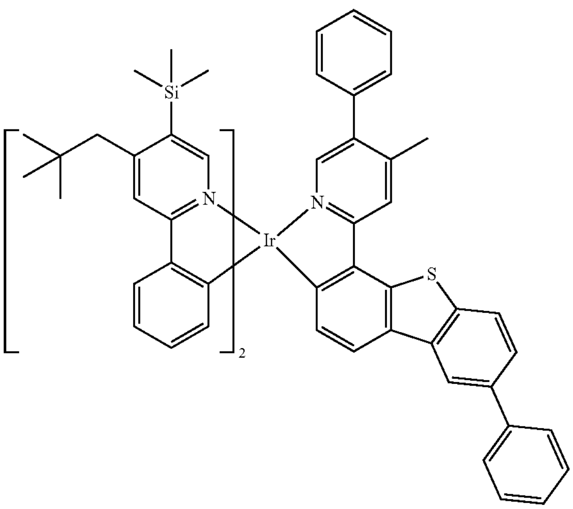
879
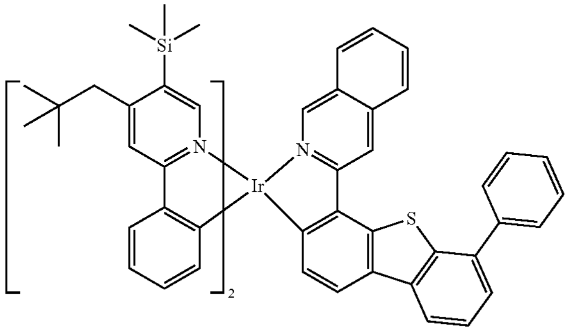
880
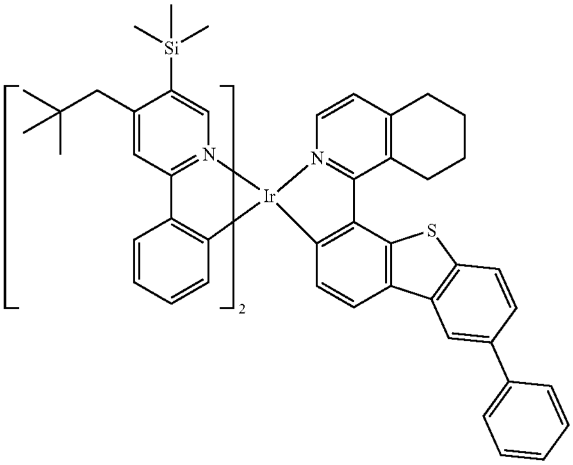
-continued
881
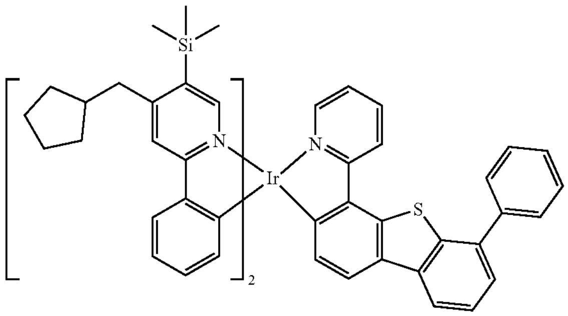
882
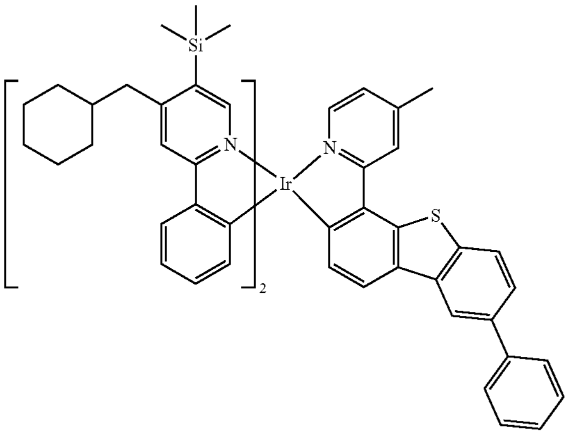
883
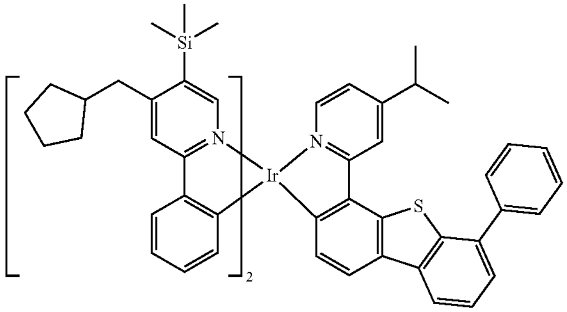
884
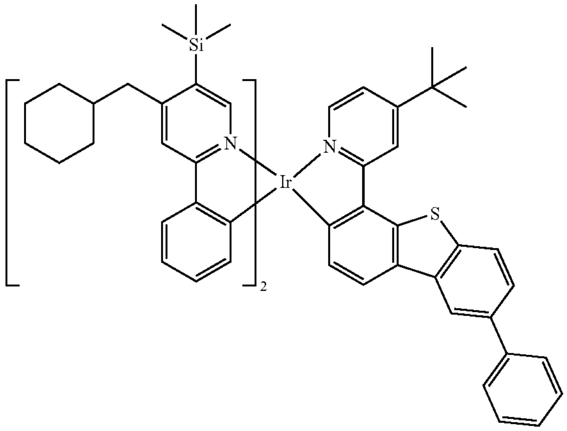

-continued
885
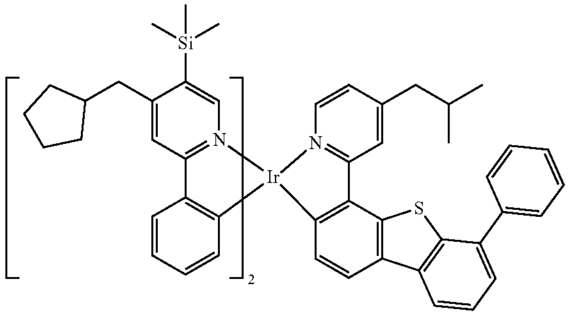
886
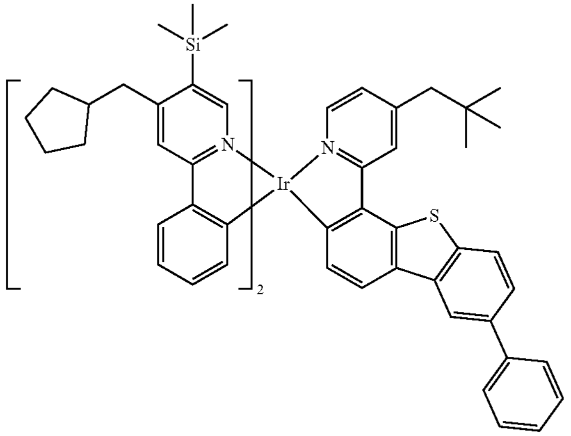
887
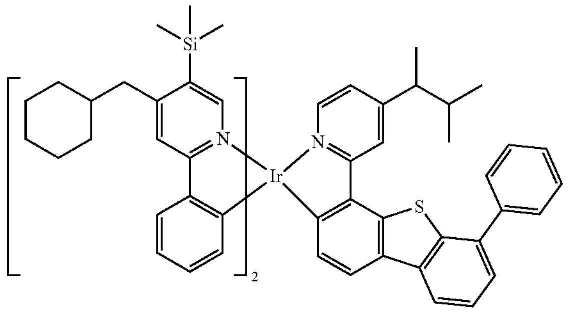
888
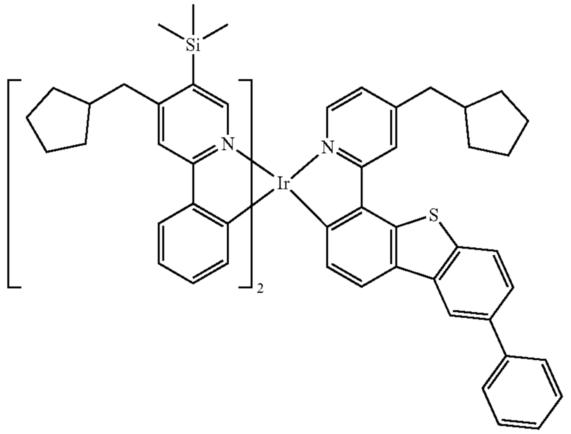
-continued
889
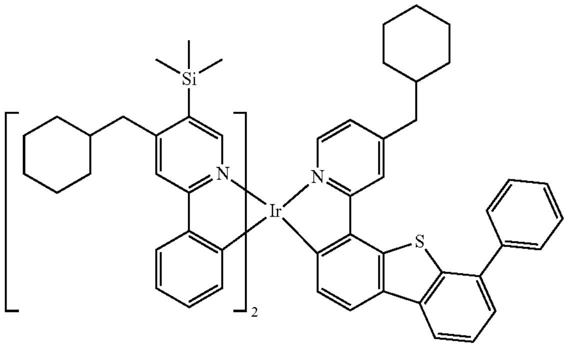
890
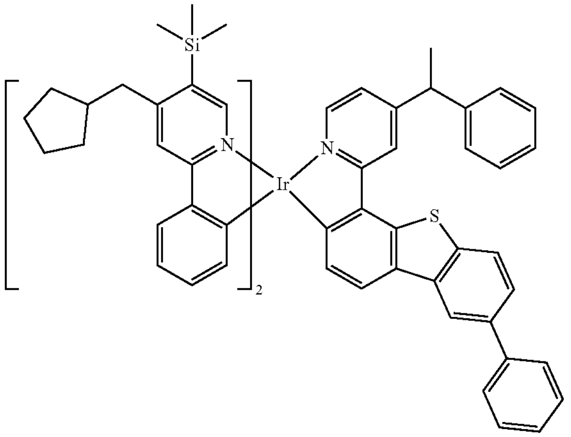
891
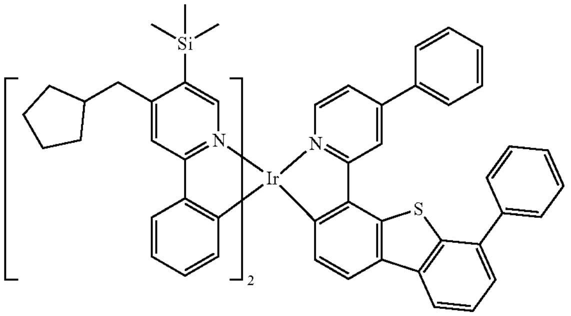
892
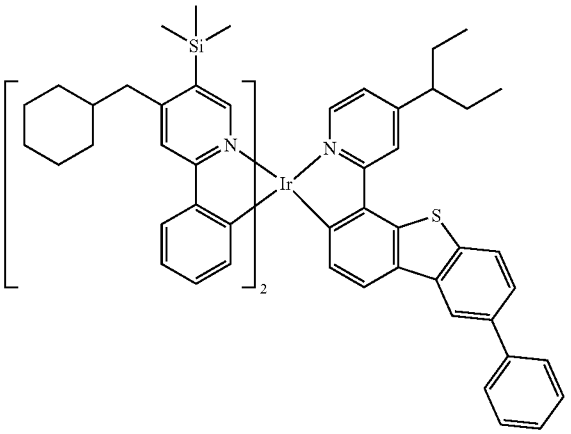

-continued
893
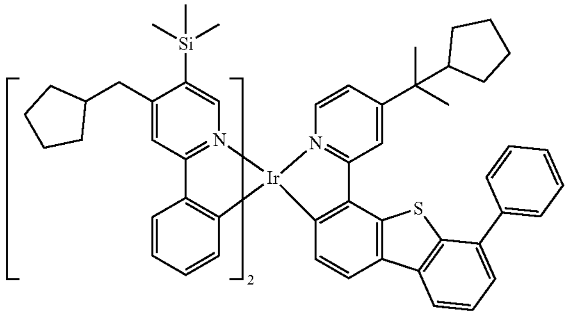
894
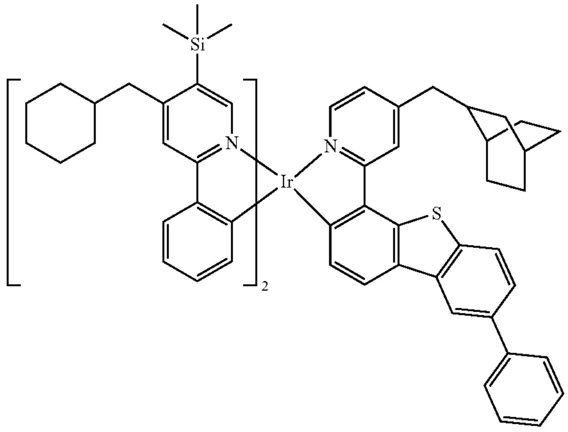
895
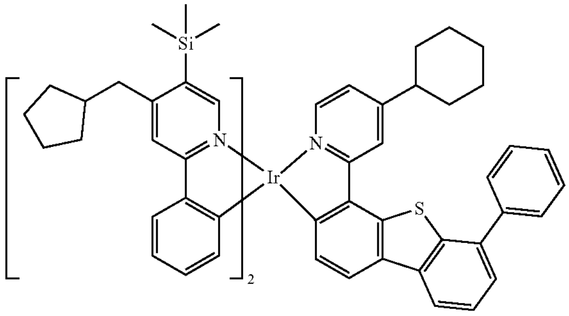
896
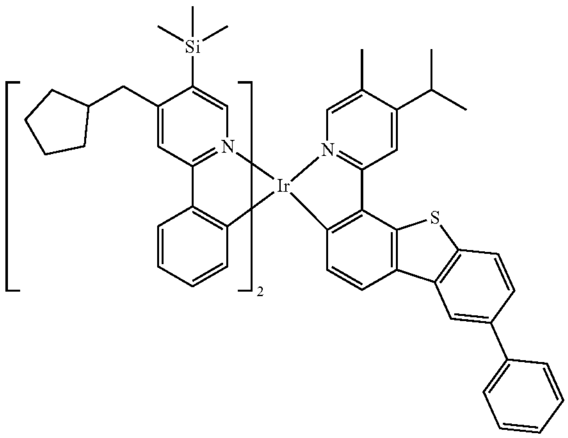
-continued
897
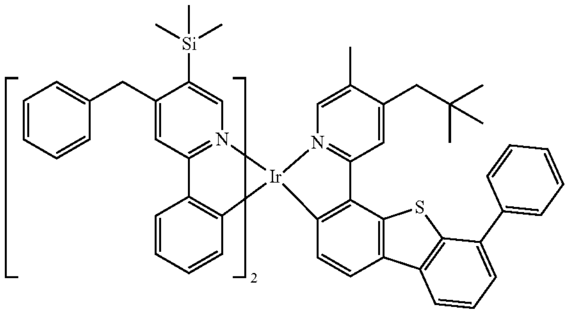
898
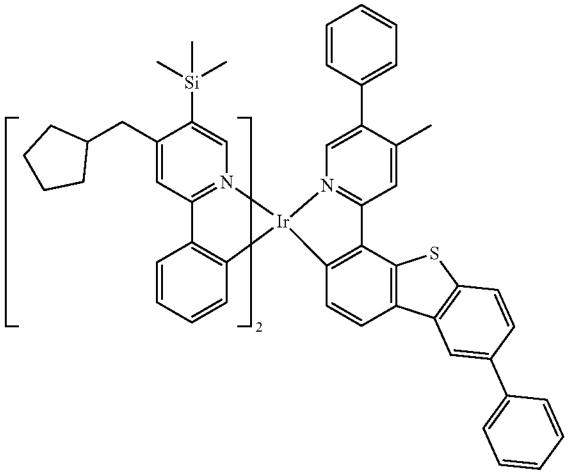
899
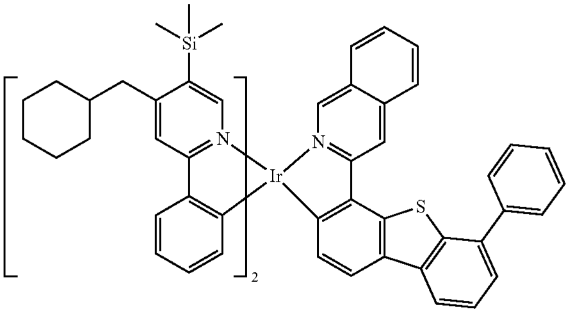
900
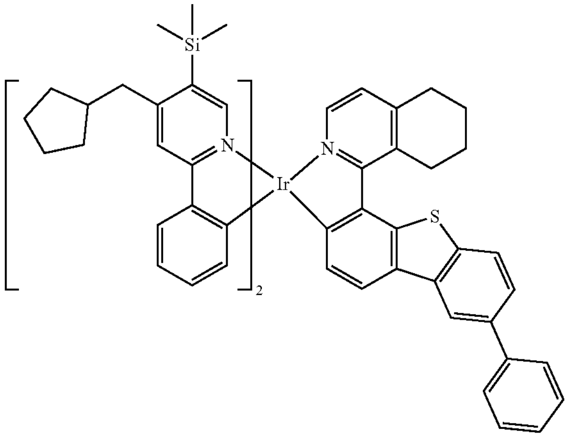

-continued
901
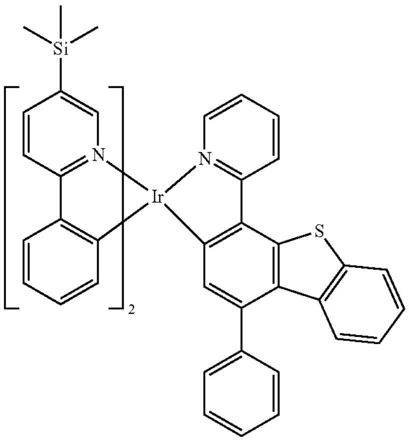
904
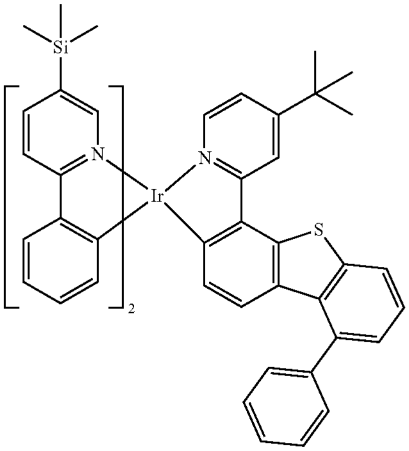
902
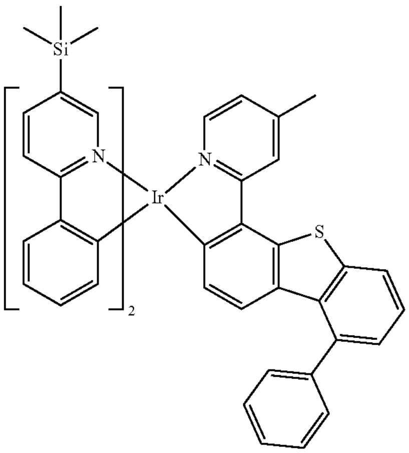
905
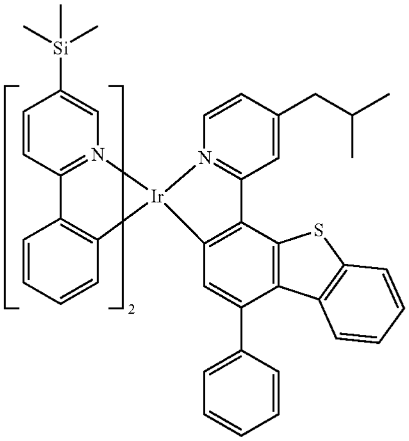
903
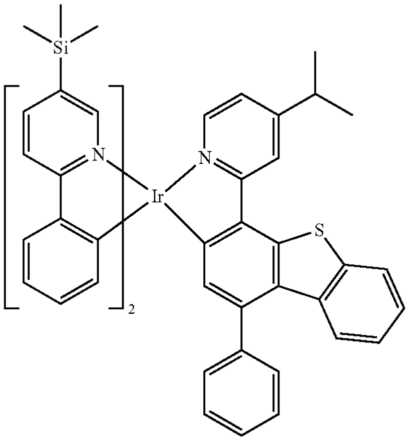
906
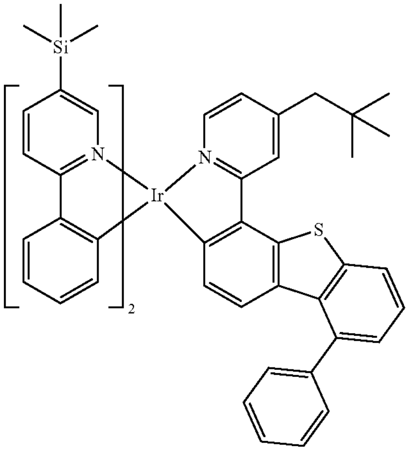

-continued
907
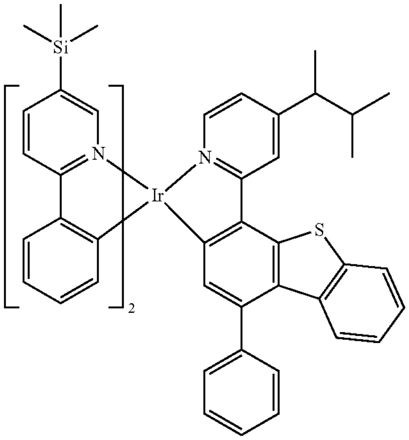
910
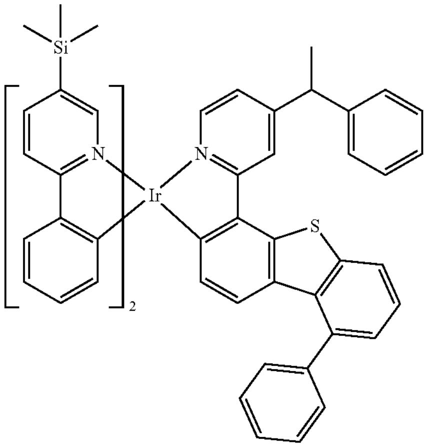
908
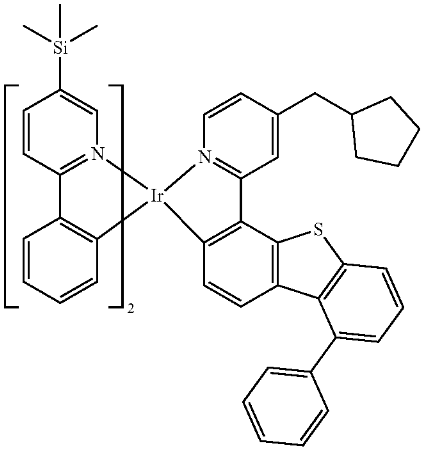
911
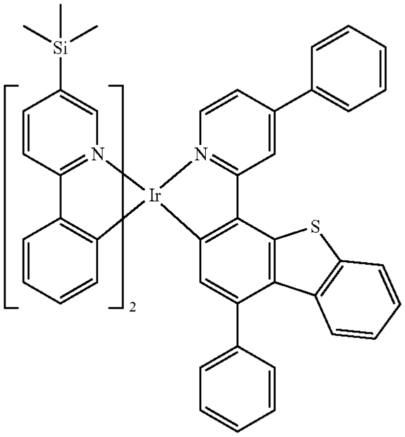
909
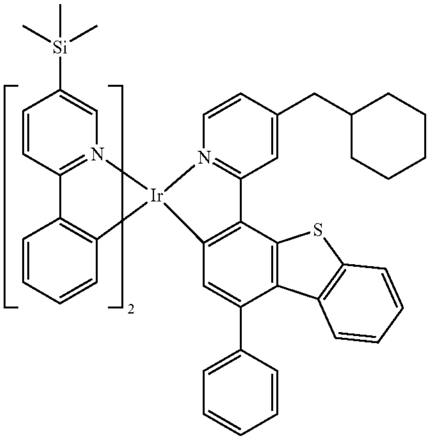
912
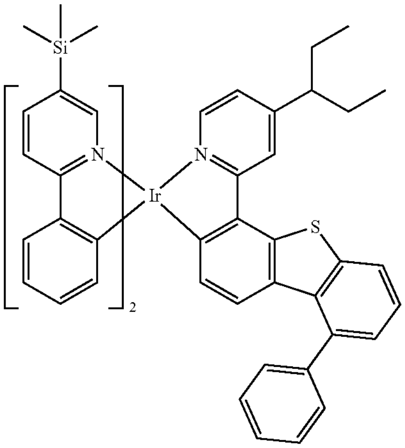

-continued
913
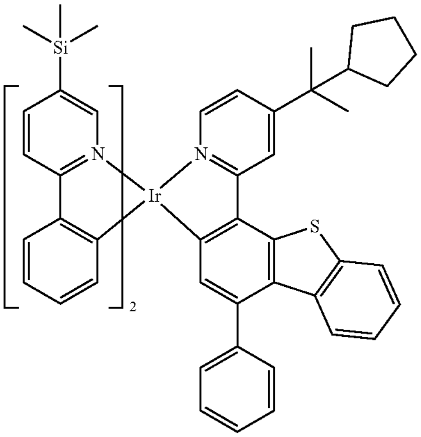
914
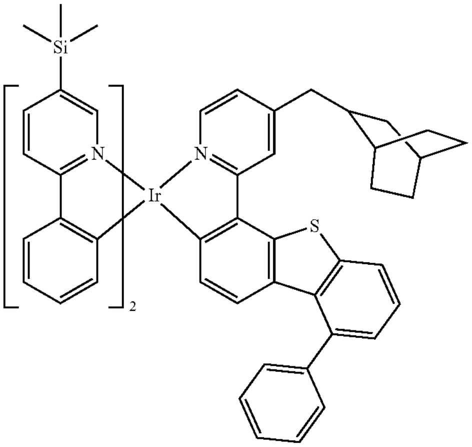
915
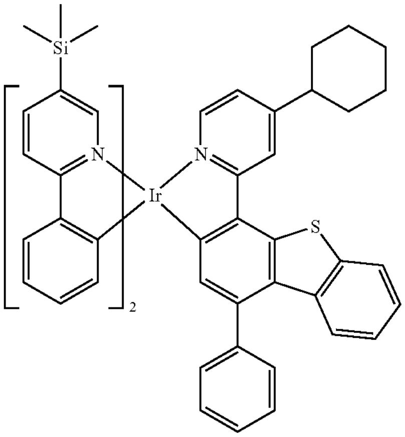
-continued
916
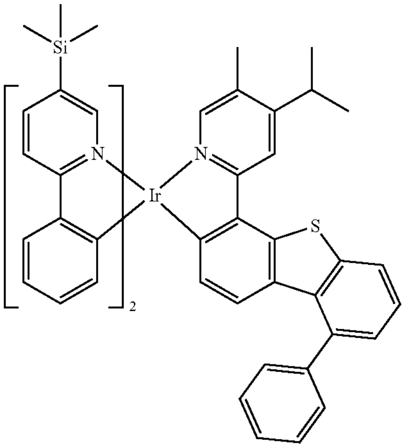
917
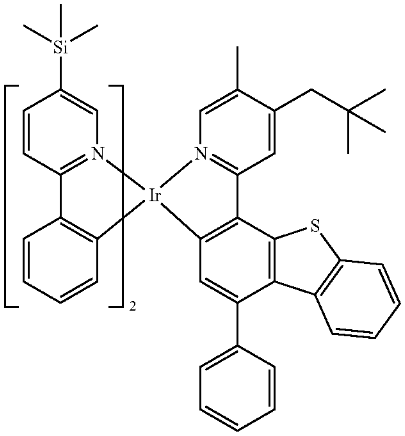
918
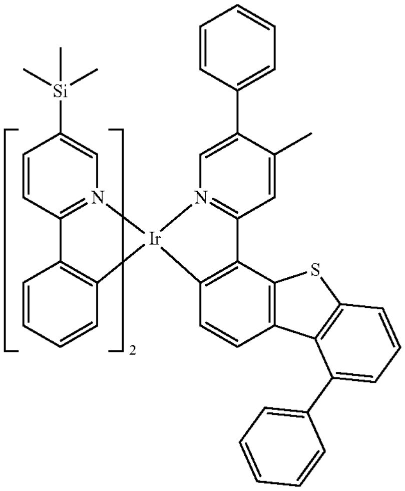

919
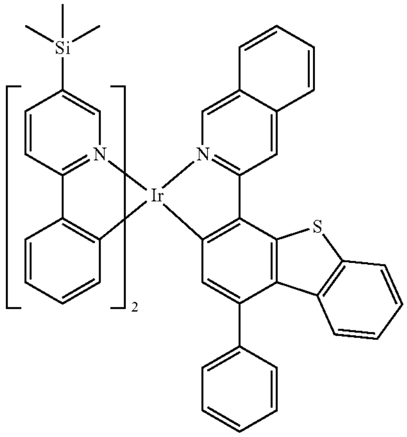
920
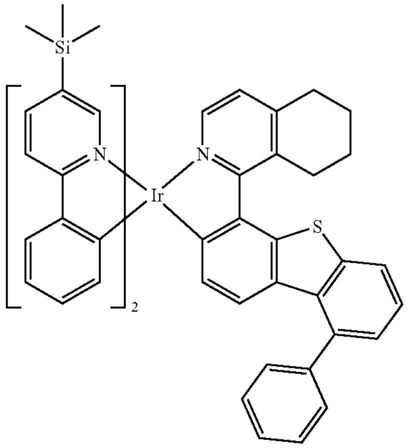
921
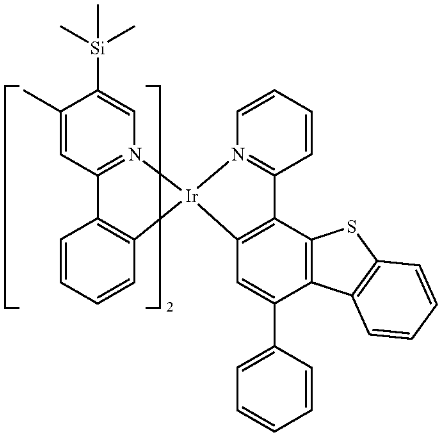
922
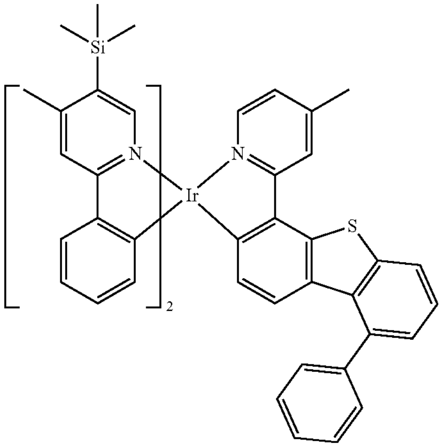
923
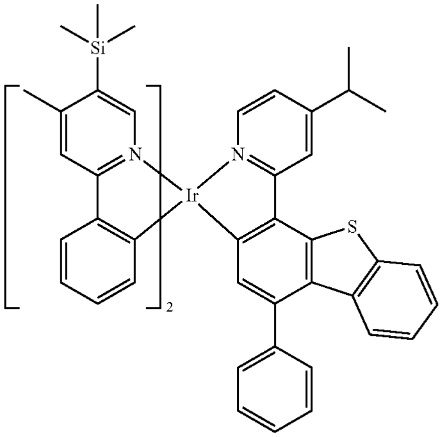
924
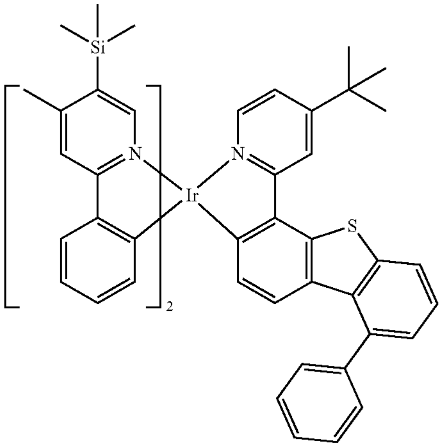

-continued
925
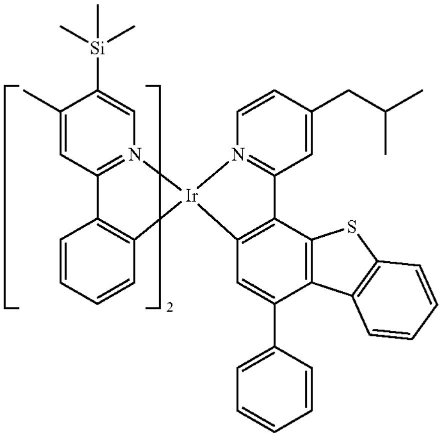
926
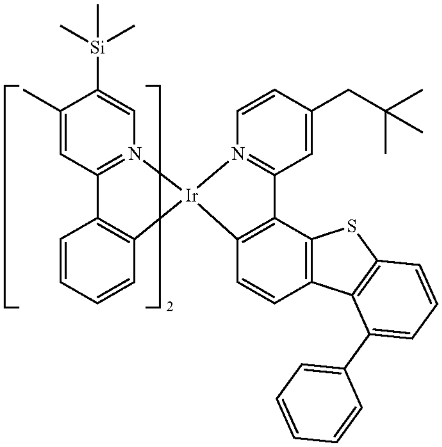
927
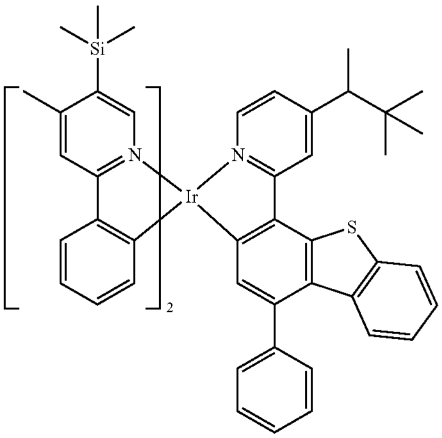
-continued
928
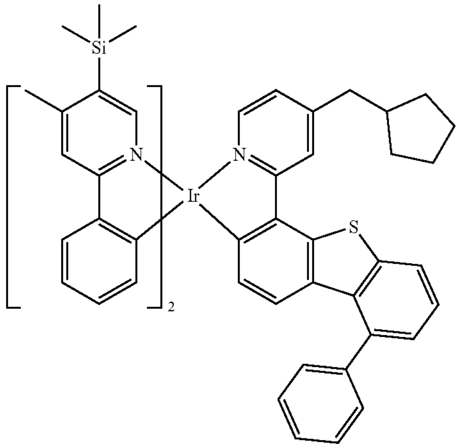
929
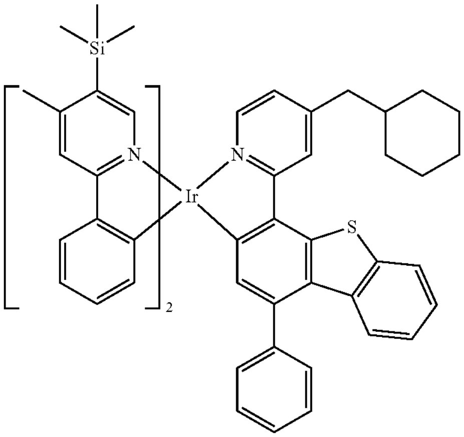
930
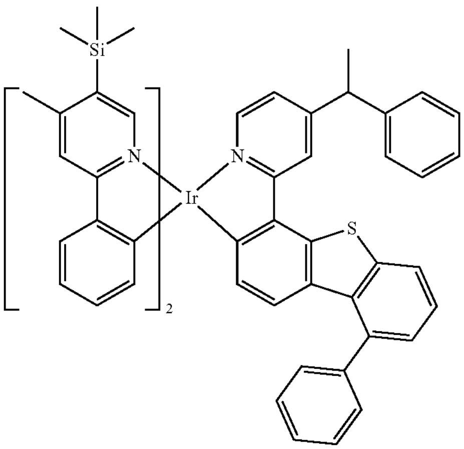

-continued
931
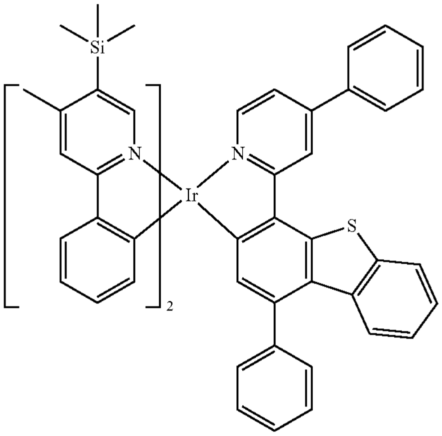
932
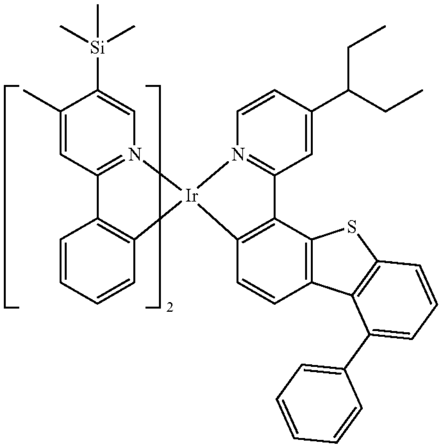
933
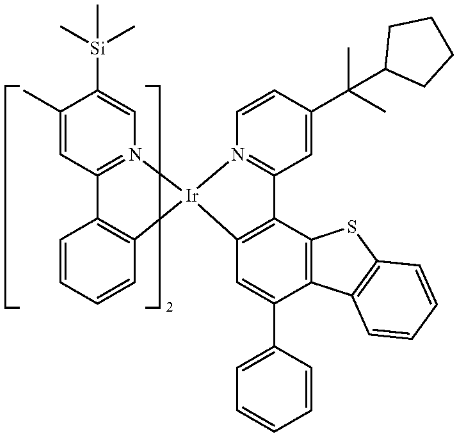
-continued
934
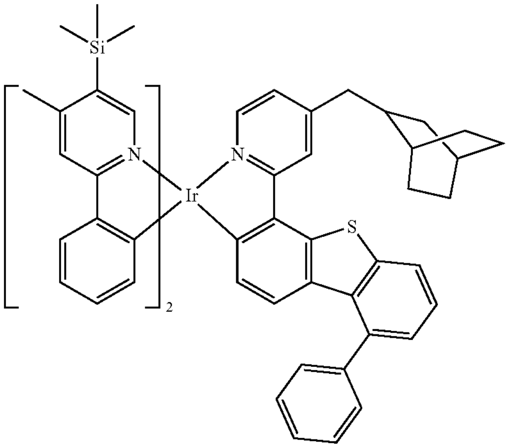
935
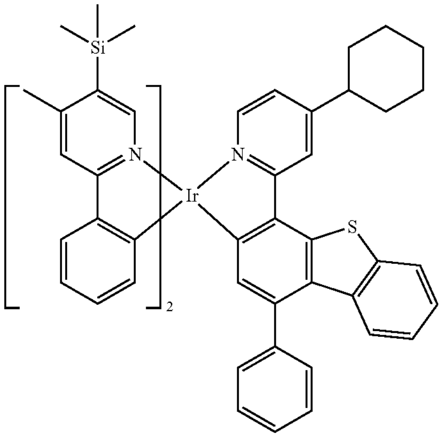
936
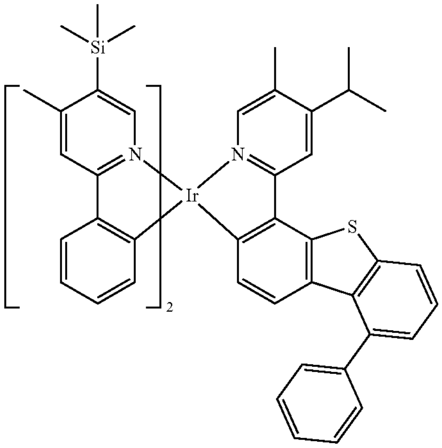

-continued
937
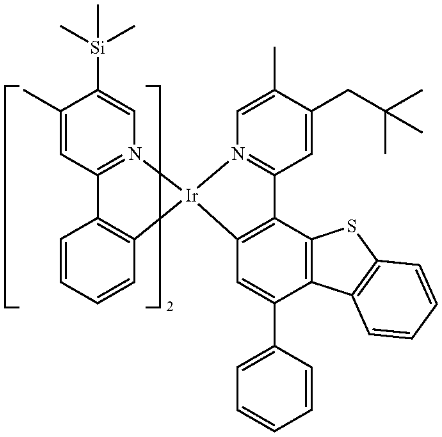
938
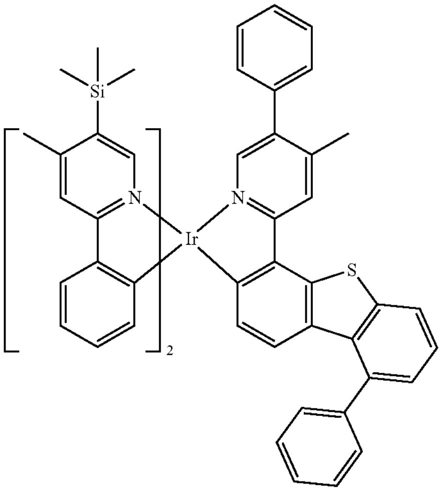
939
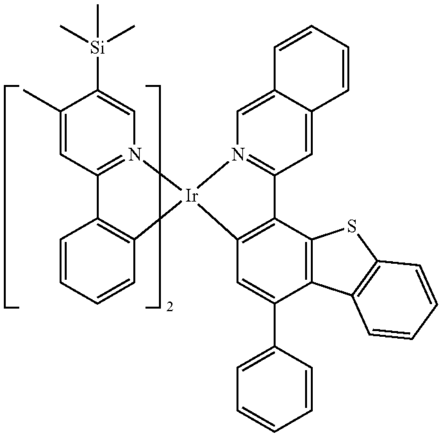
-continued
940
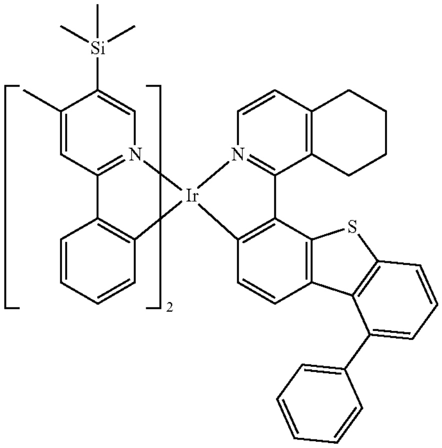
941
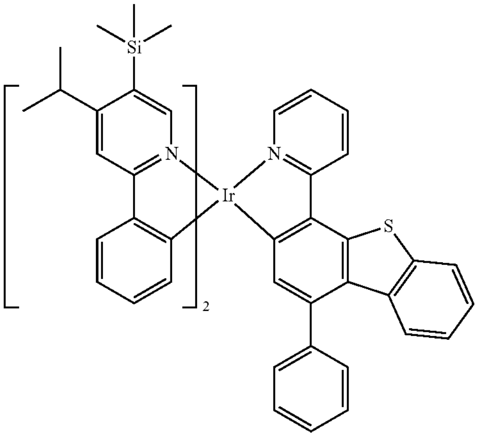
942
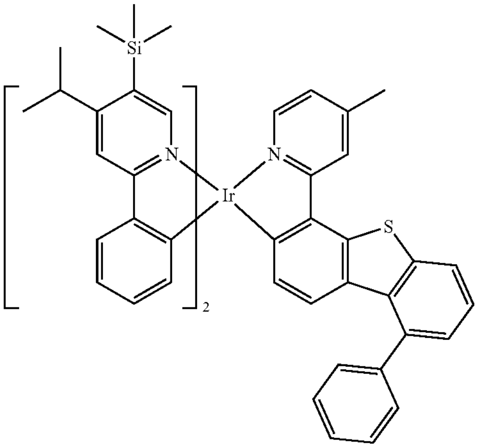

943
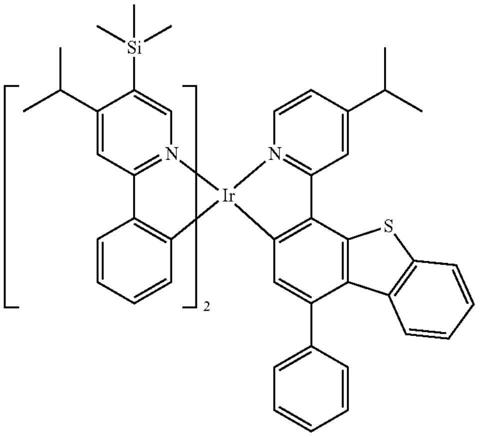
944
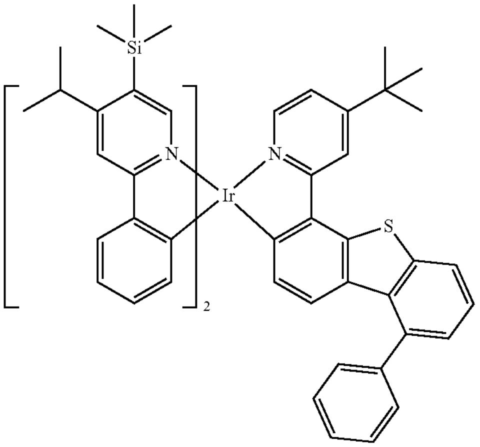
945
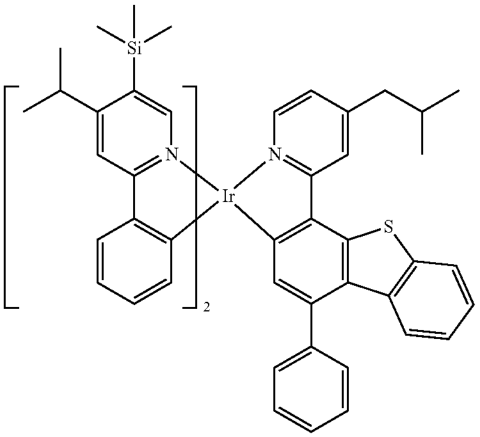
946
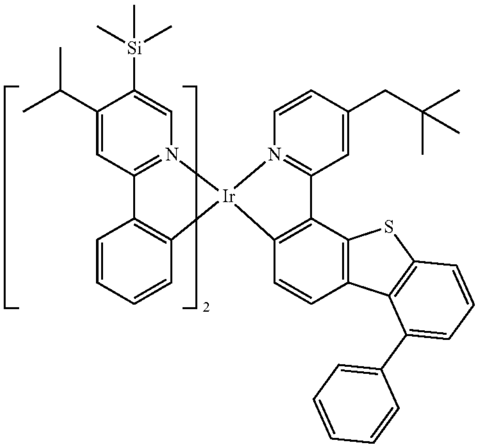
947
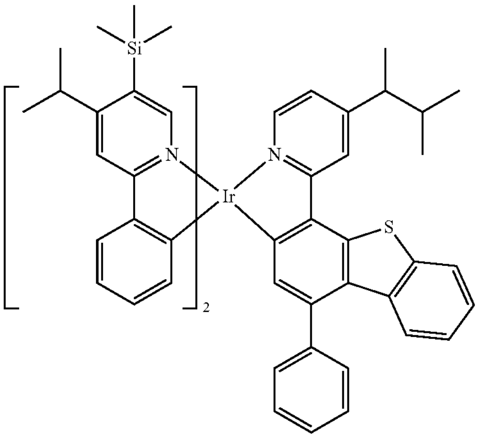
948
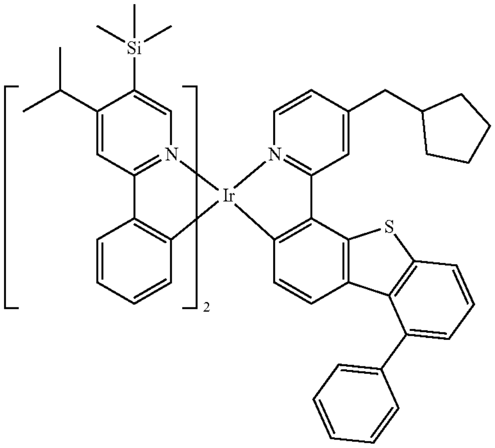

-continued
949
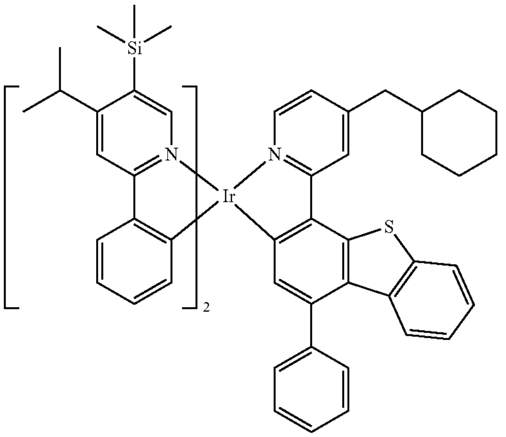
950
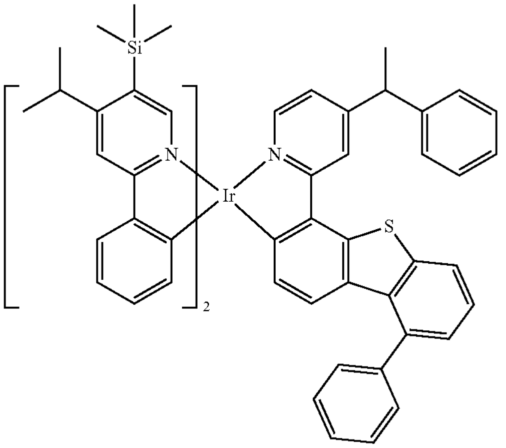
951
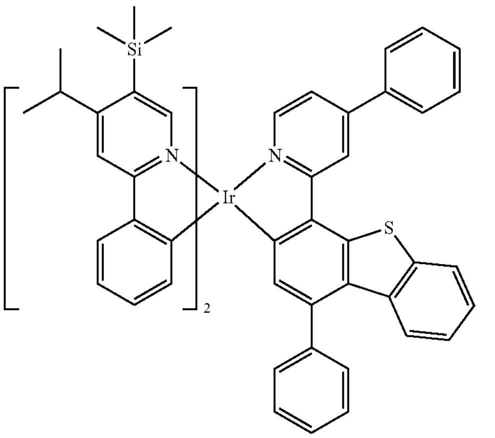
-continued
952
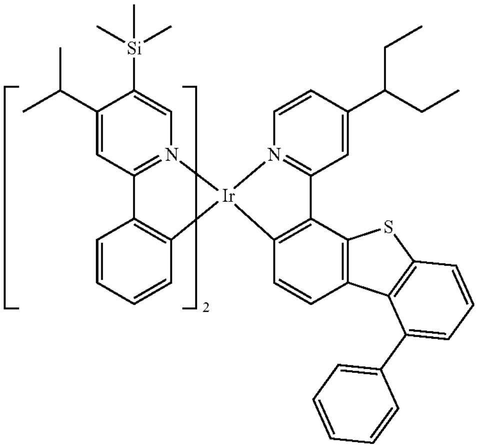
953
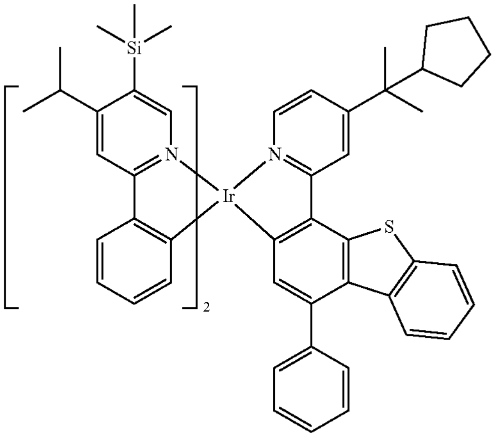
954
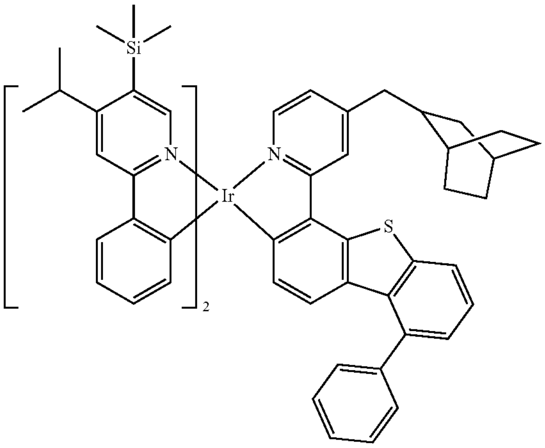

-continued
955
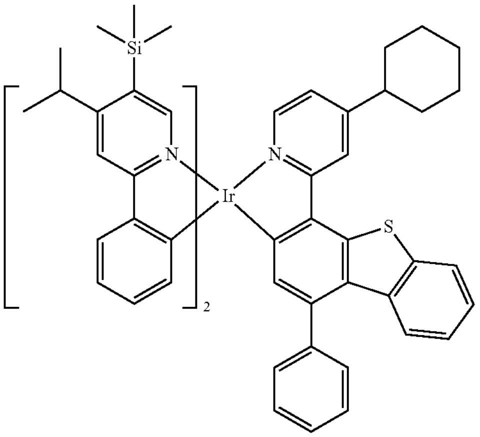
956
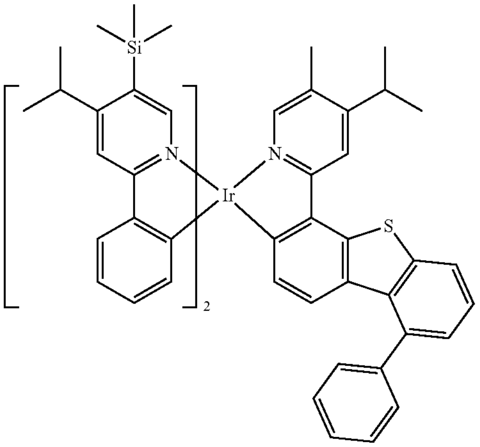
957
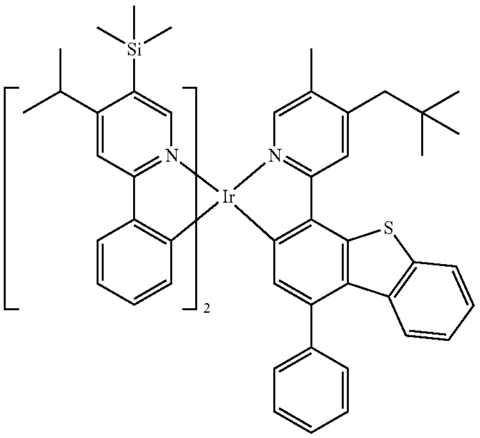
-continued
958
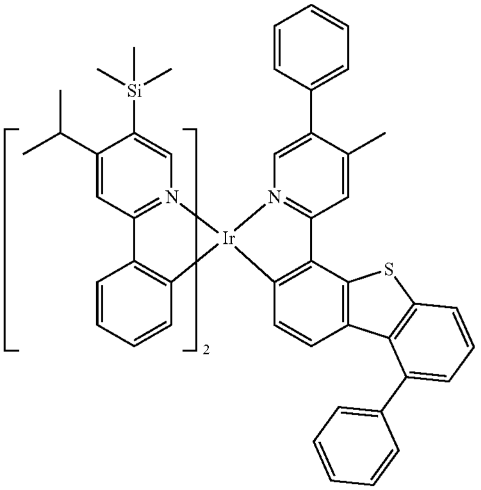
959
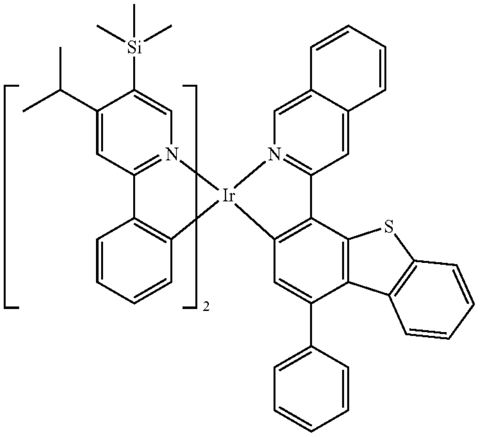
960
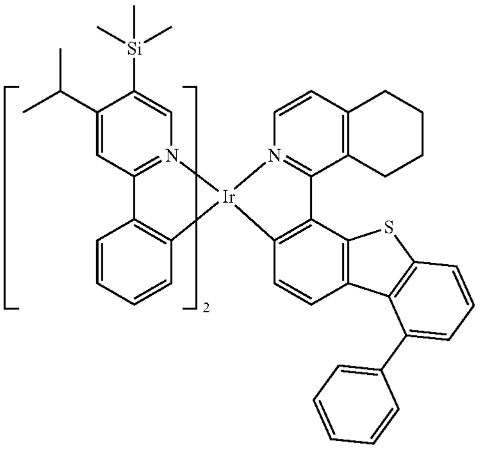

-continued
961
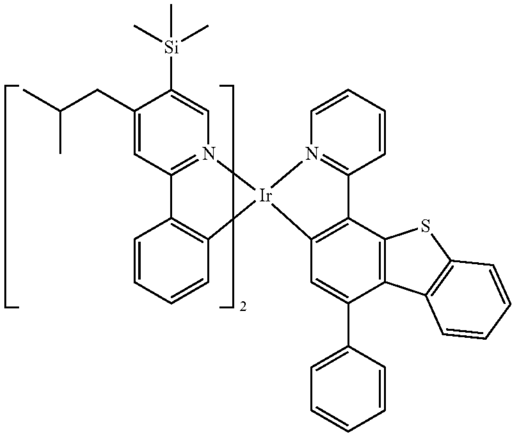
962
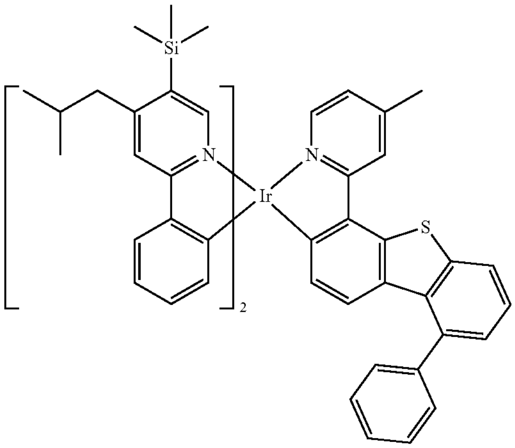
963
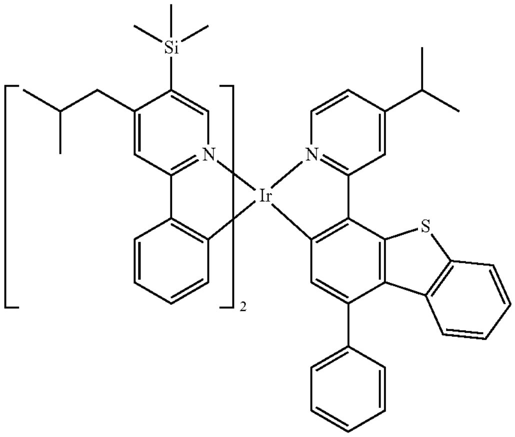
-continued
964
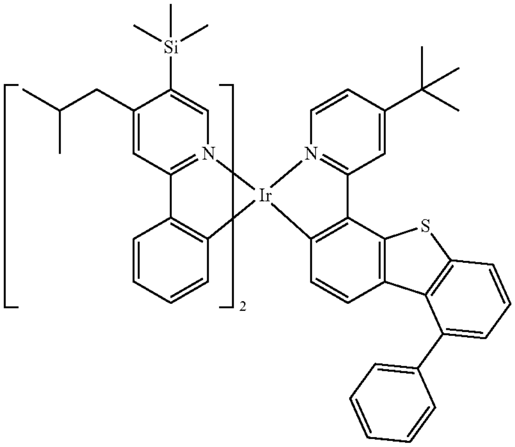
965
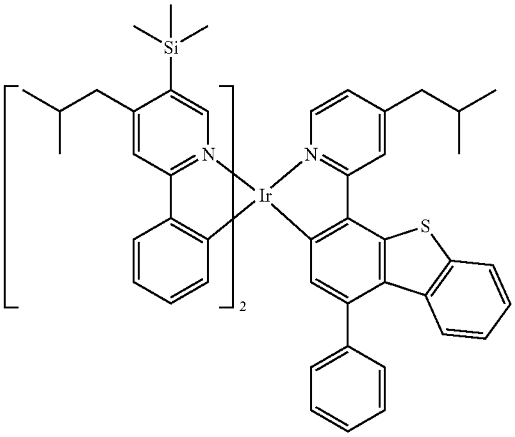
966
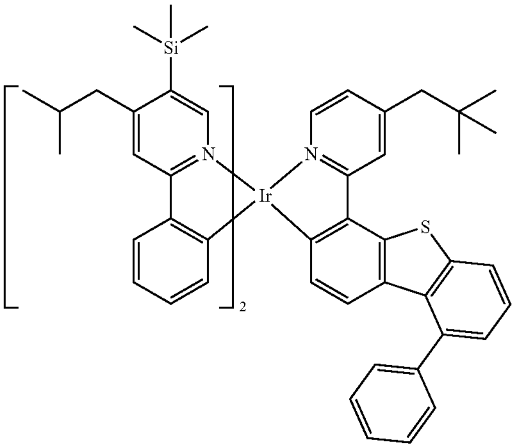

967
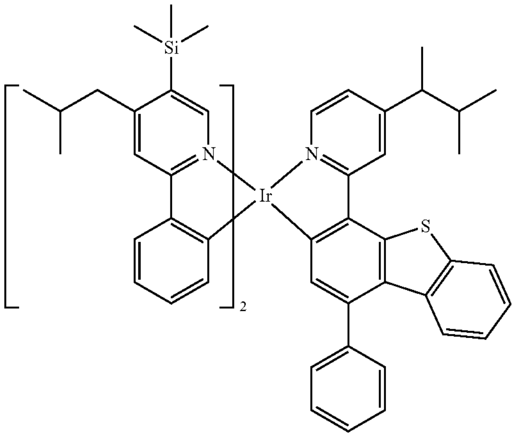
968
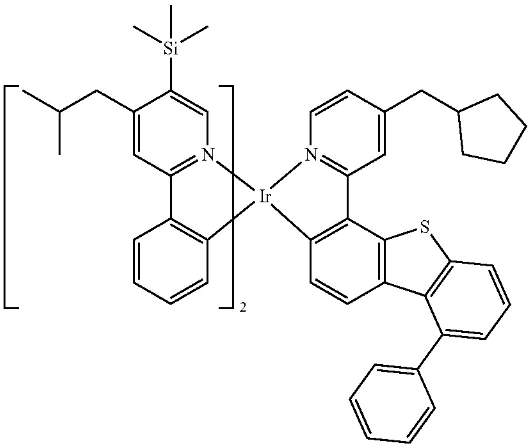
969
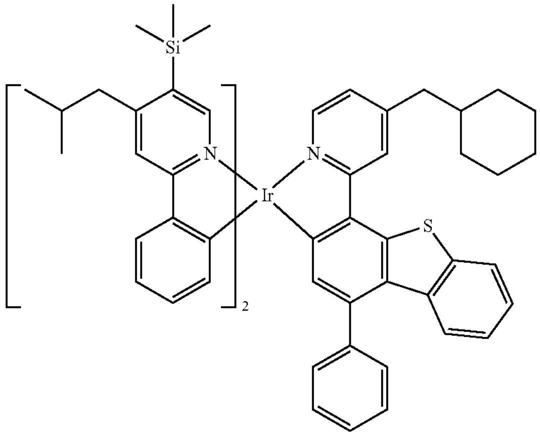
970
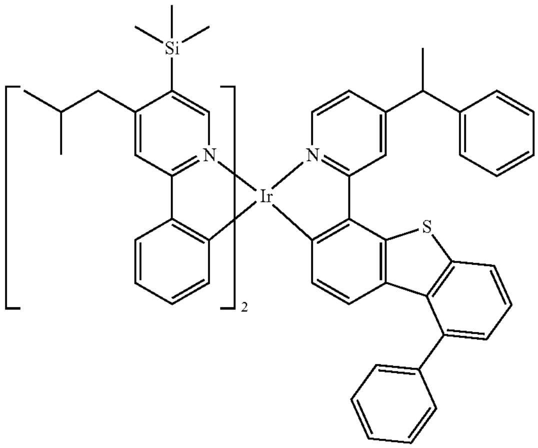
971
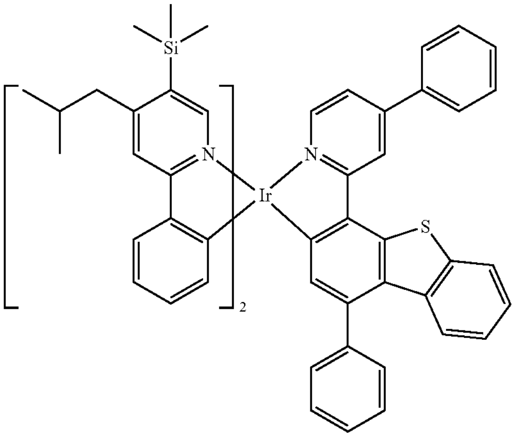
972
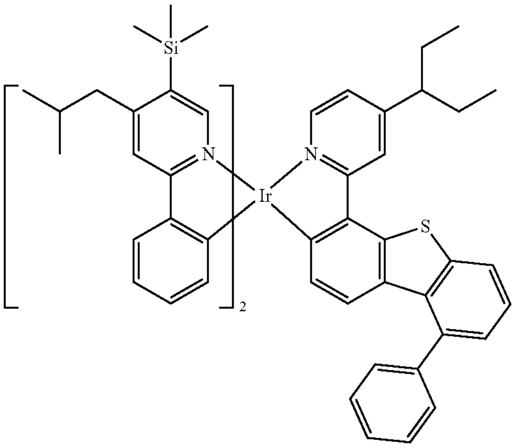

-continued
973
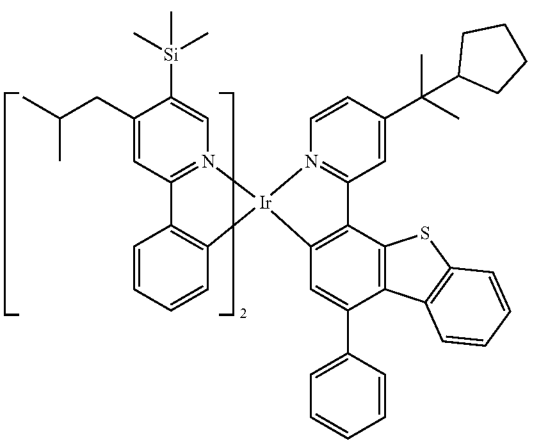
974
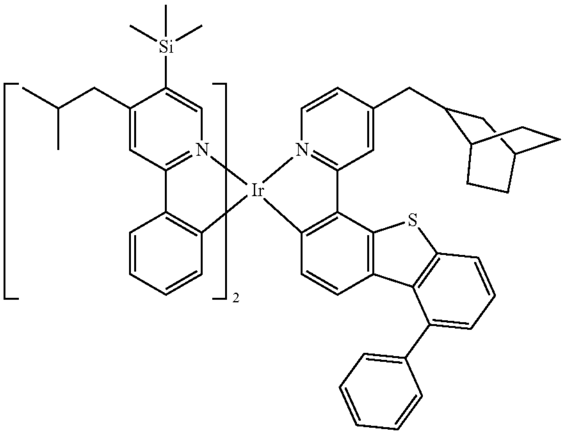
975
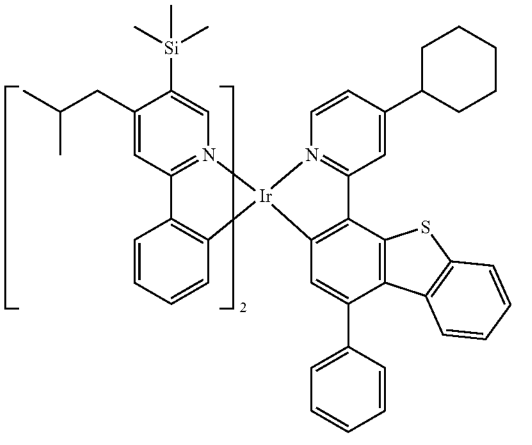
-continued
976
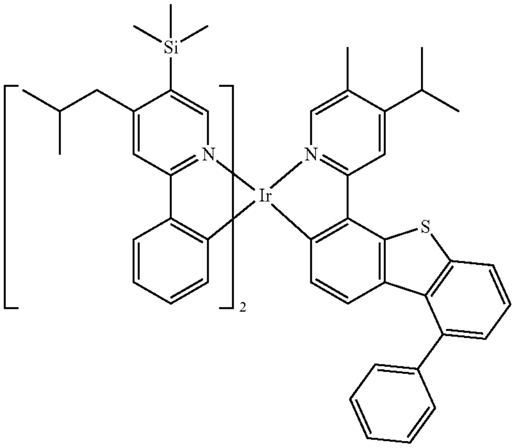
977
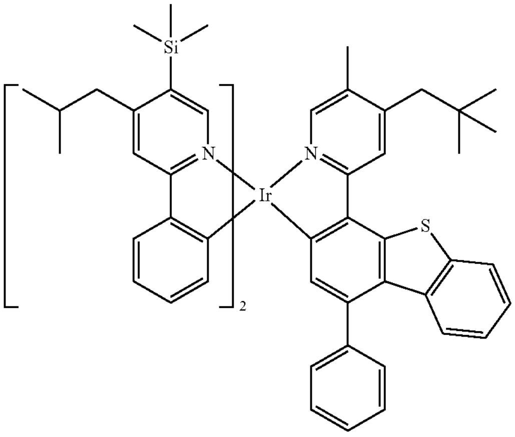
978
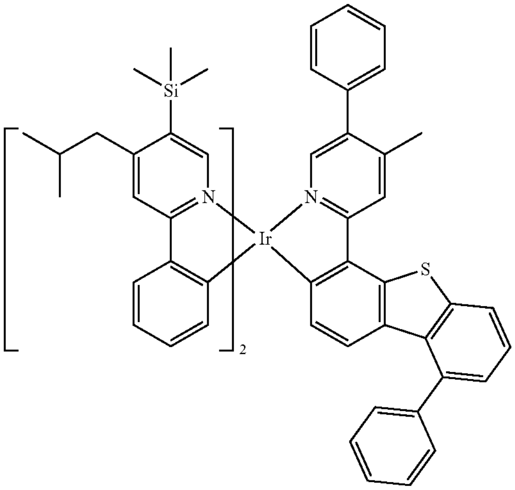

-continued
979
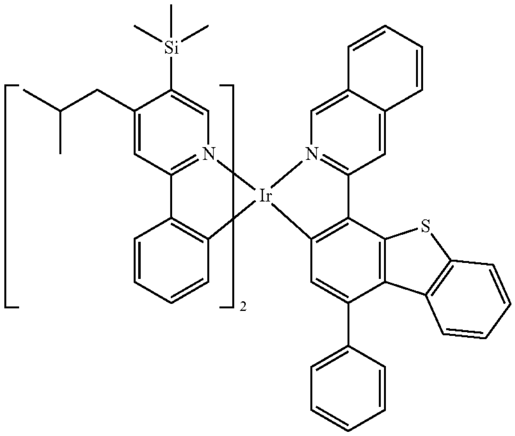
980
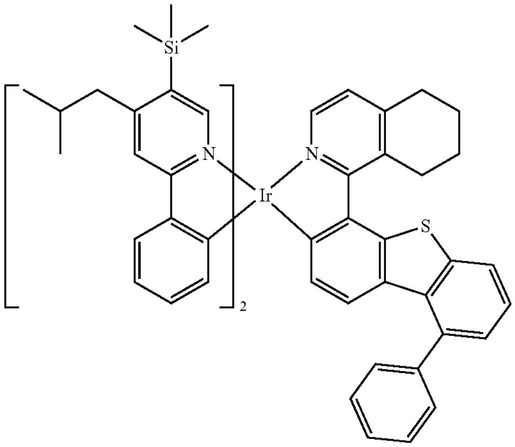
981
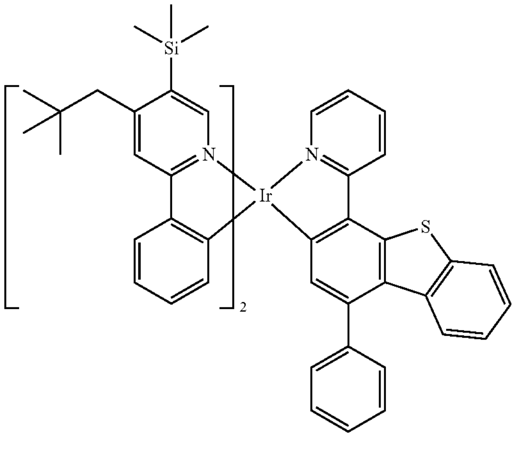
982
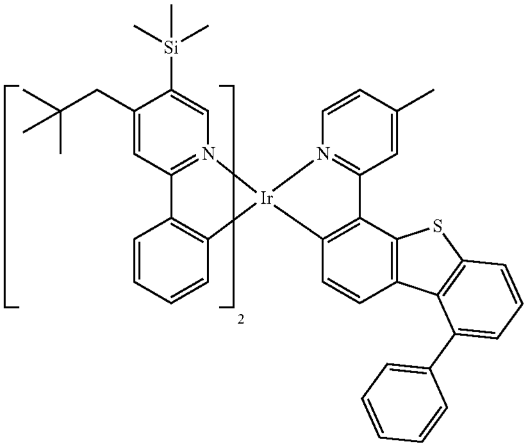
983
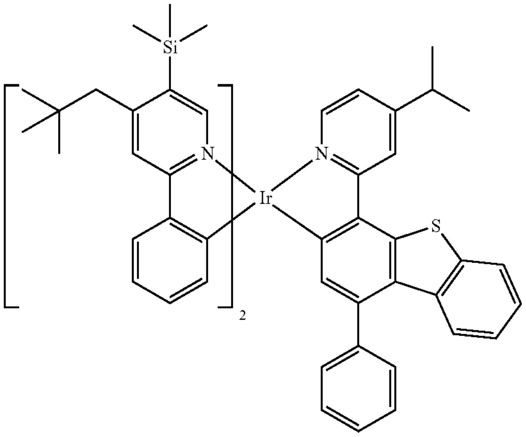
984
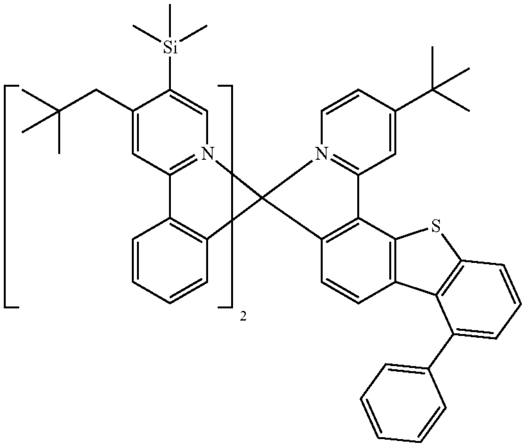

-continued
985
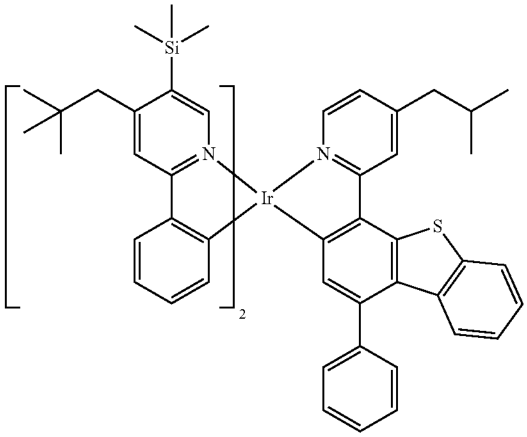
986
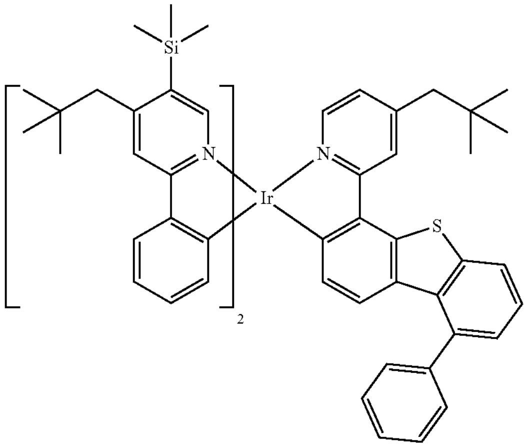
987
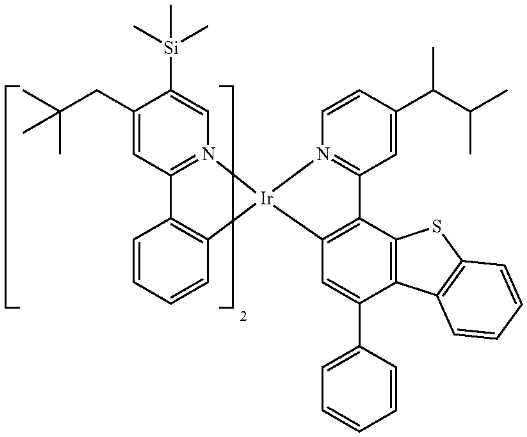
-continued
988
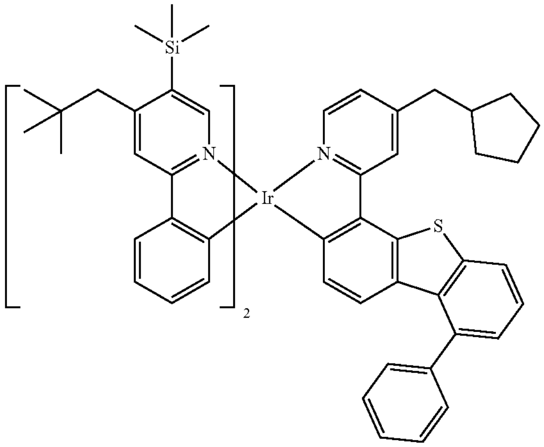
989
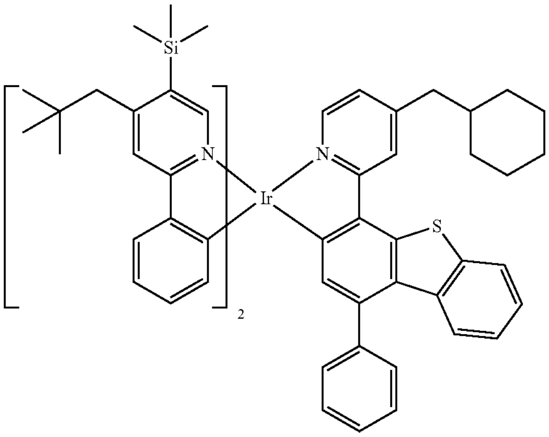
990
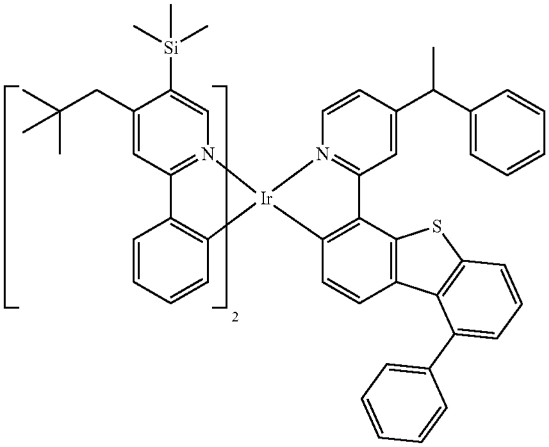

991
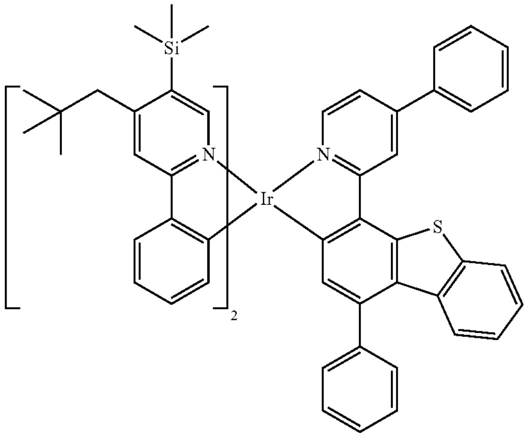
992
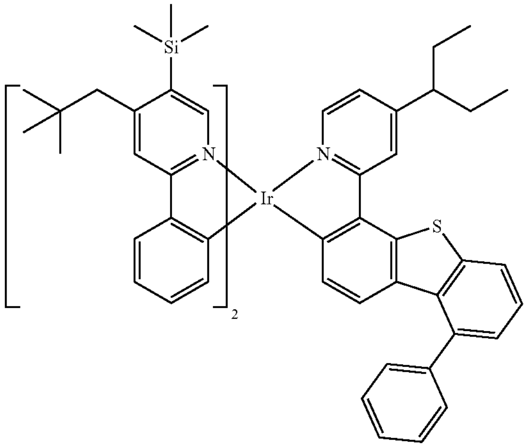
993
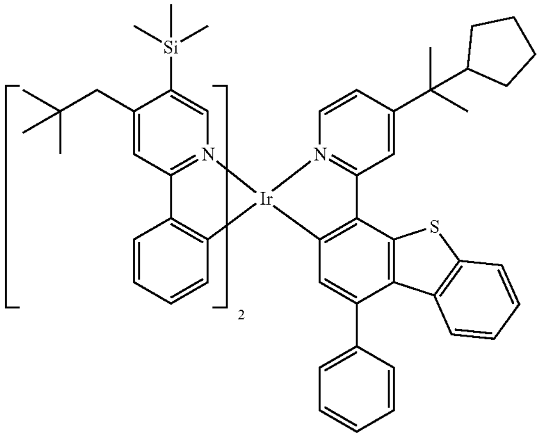
994
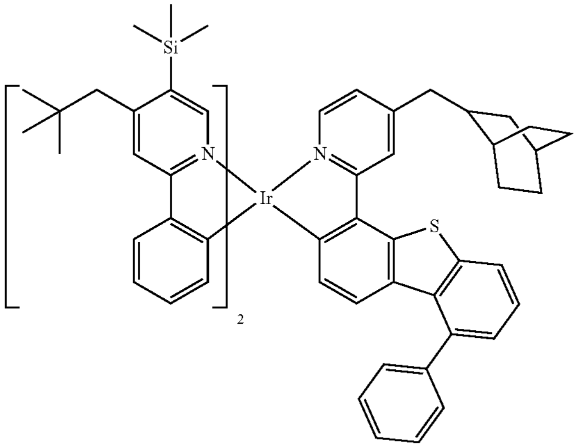
995
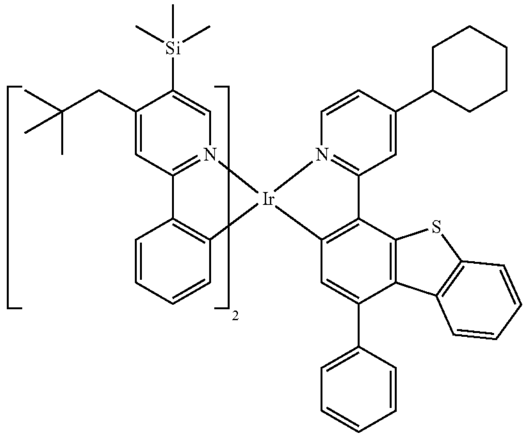
996
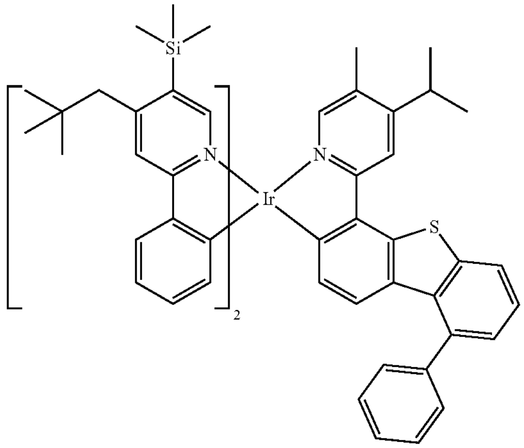

997
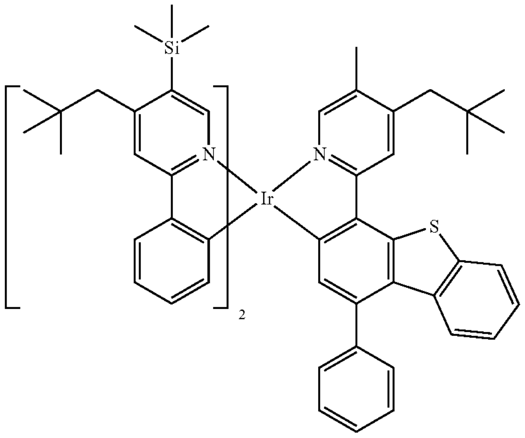
998
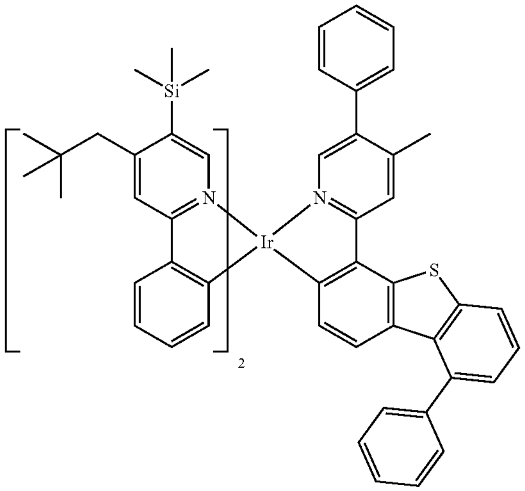
999
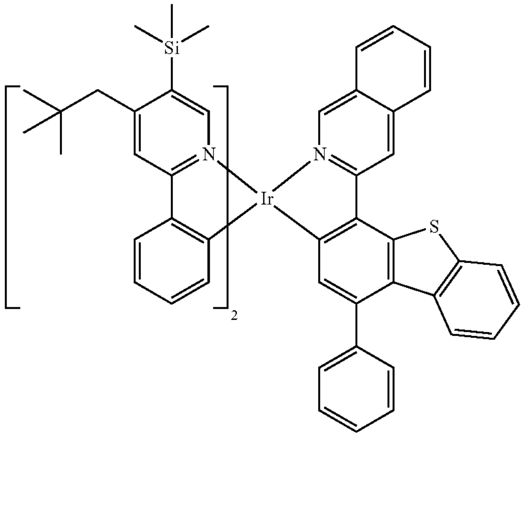
1000
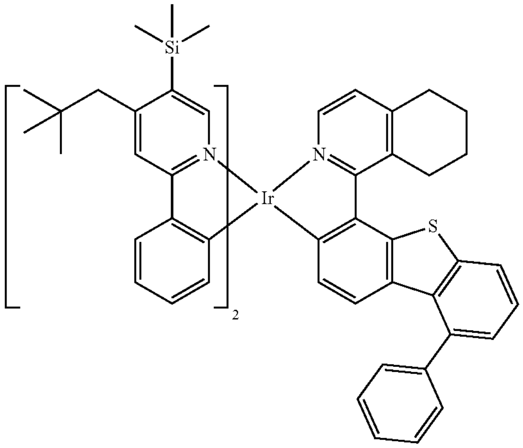
1001
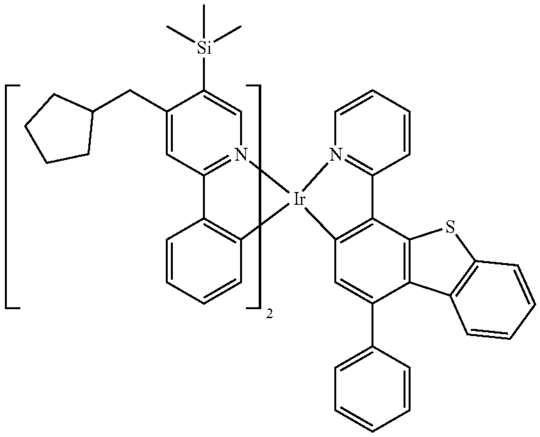
1002
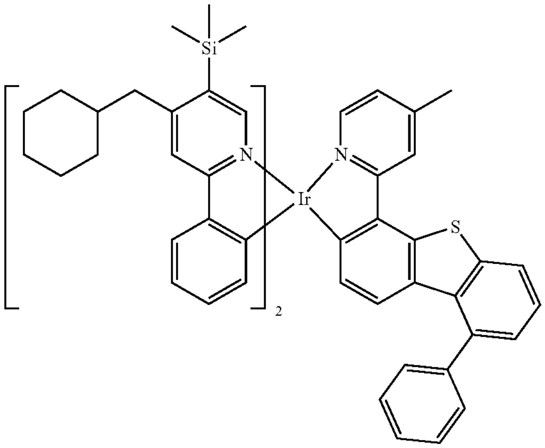

-continued
1003
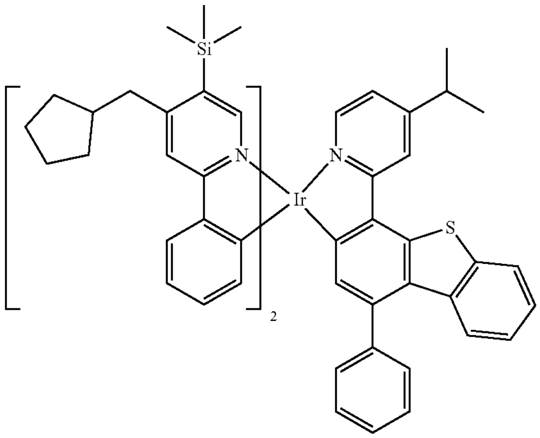
1004
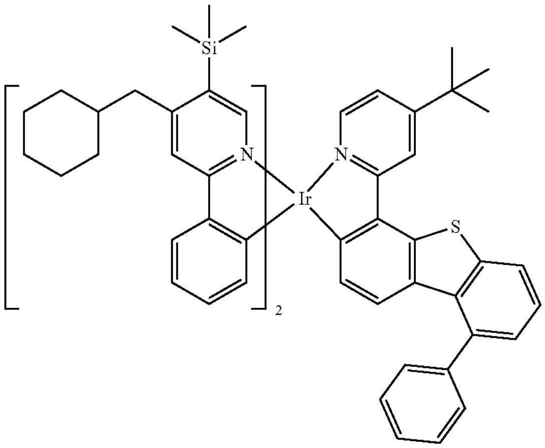
1005
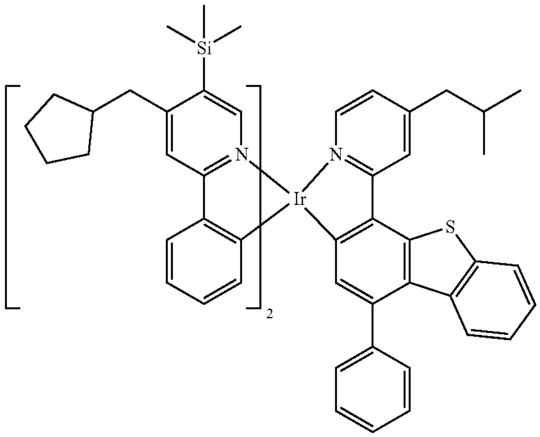
-continued
1006
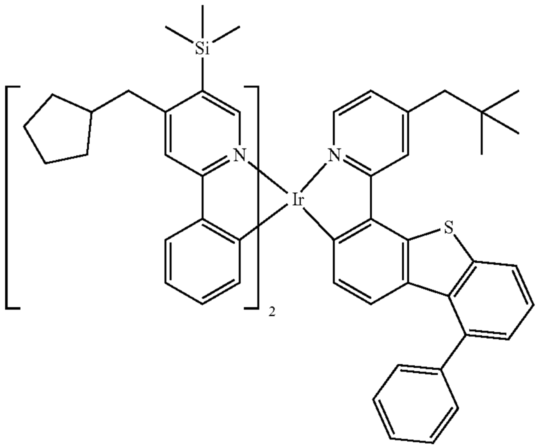
1007
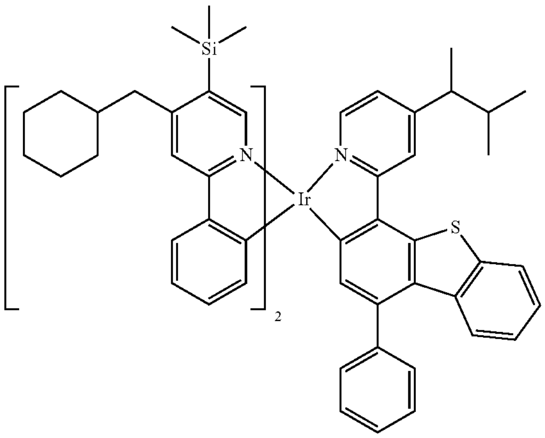
1008
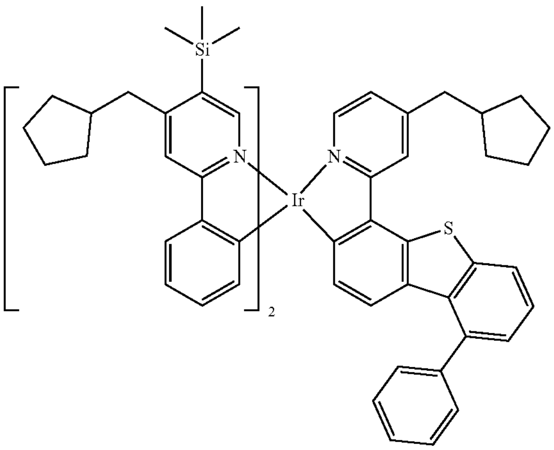

1009
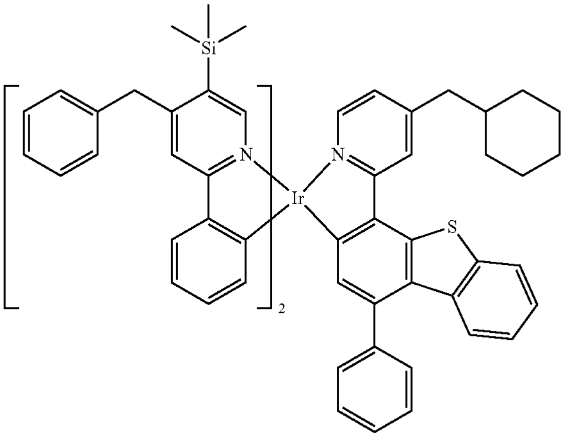
1010
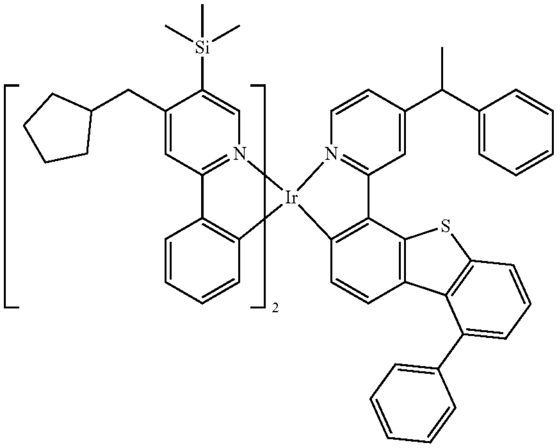
1011
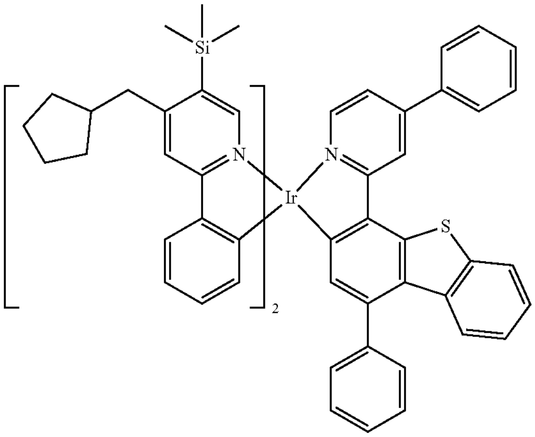
-continued
1012
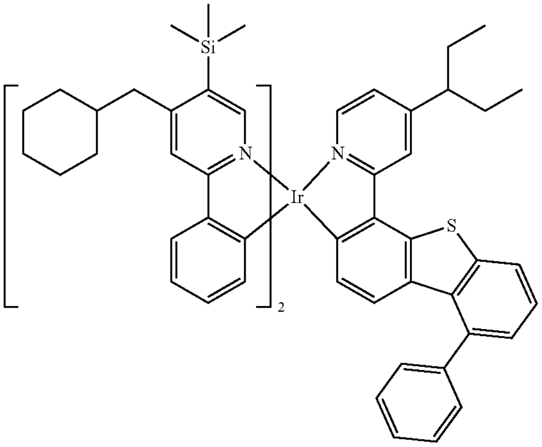
1013
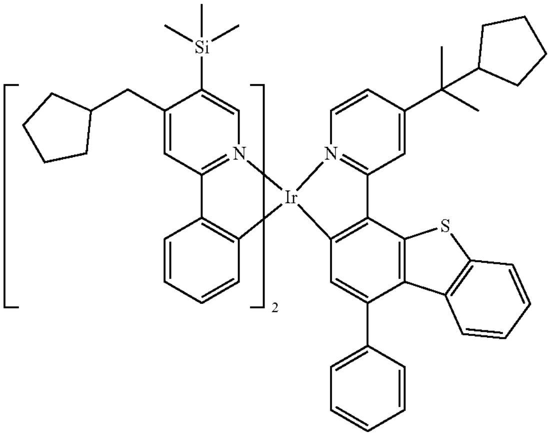
1014
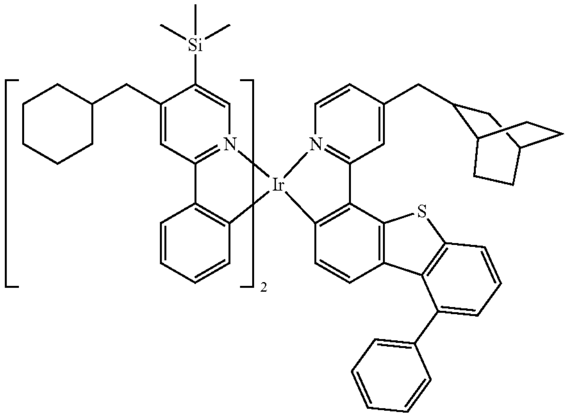

-continued
1015
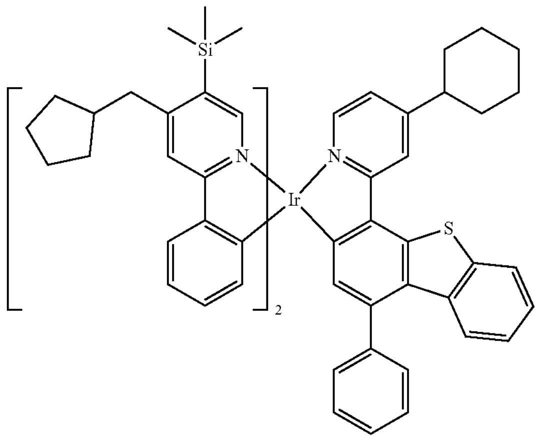
1016
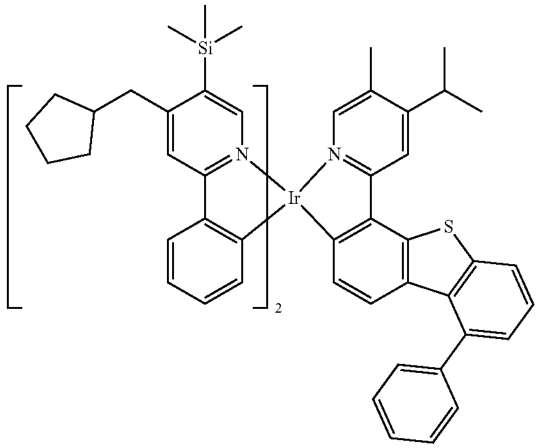
1017
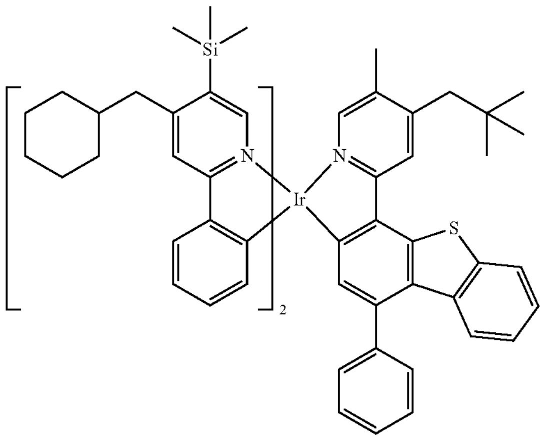
-continued
1018
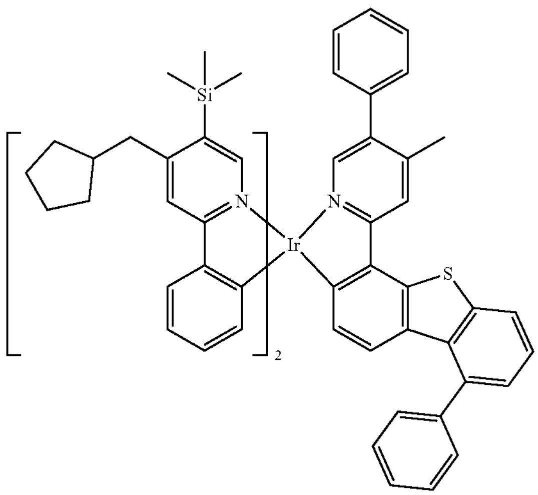
1019
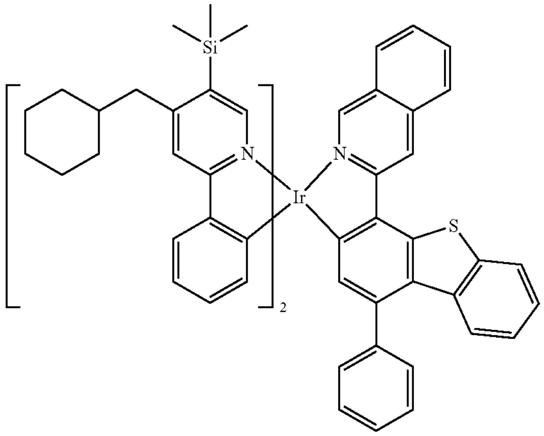
1020
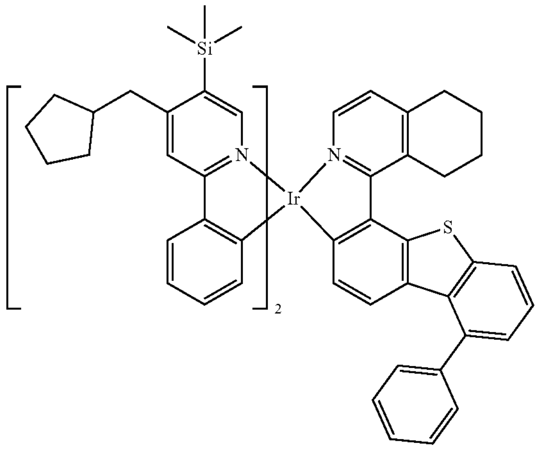

-continued
1021
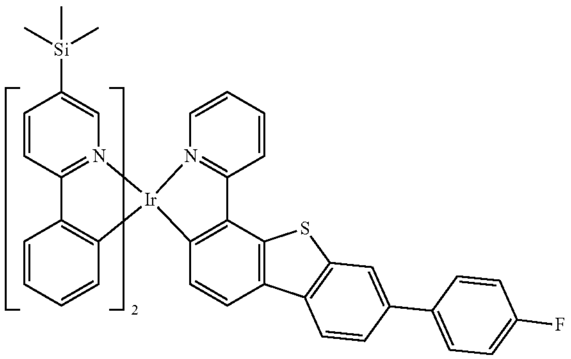
1022
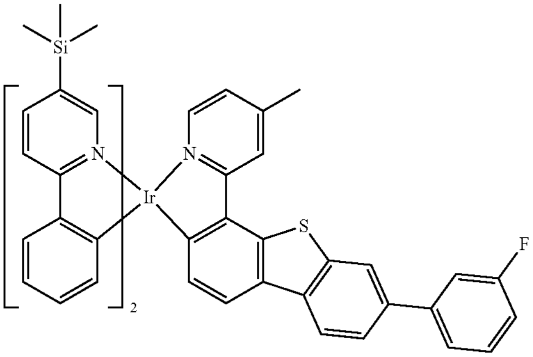
1023
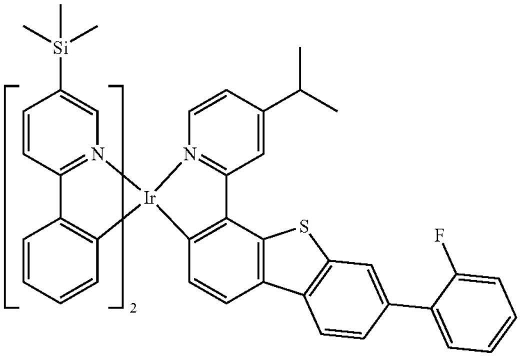
1024
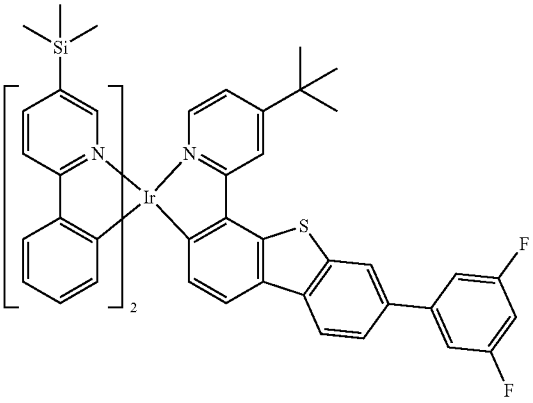
-continued
1025
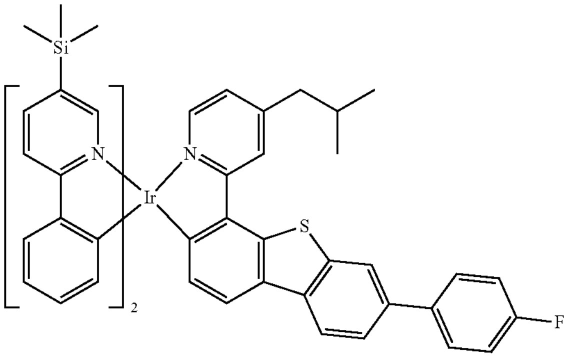
1026
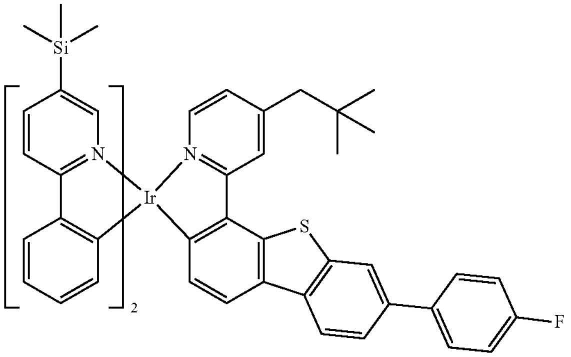
1027
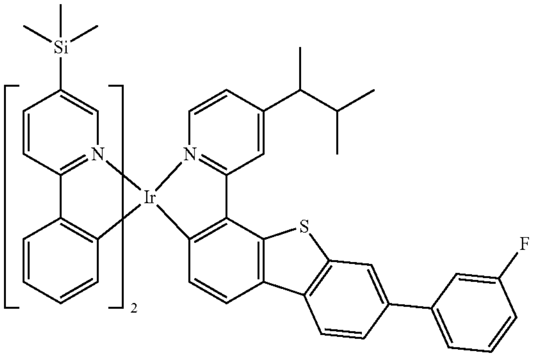
1028
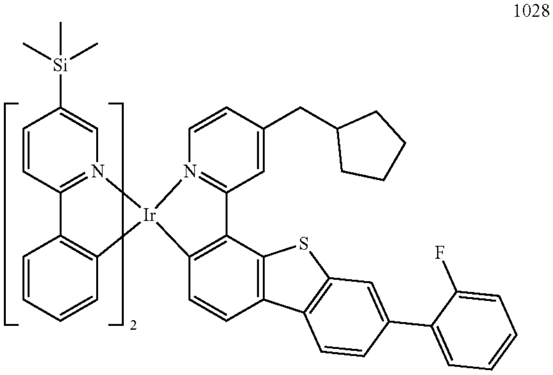

-continued
1029
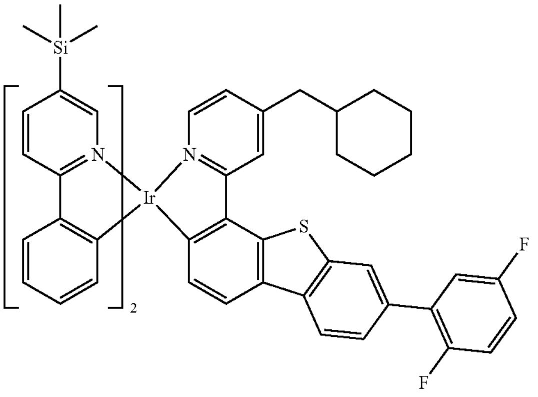
1030
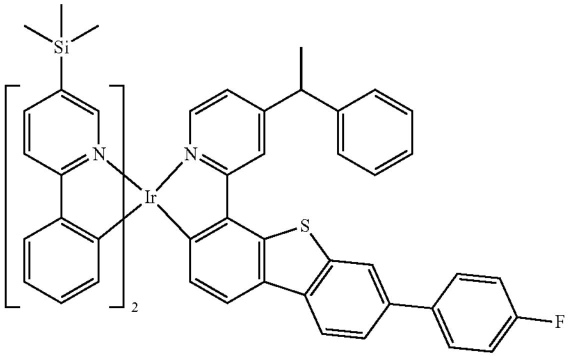
1031
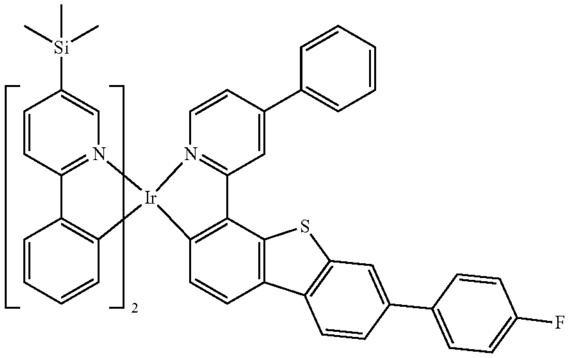
1032
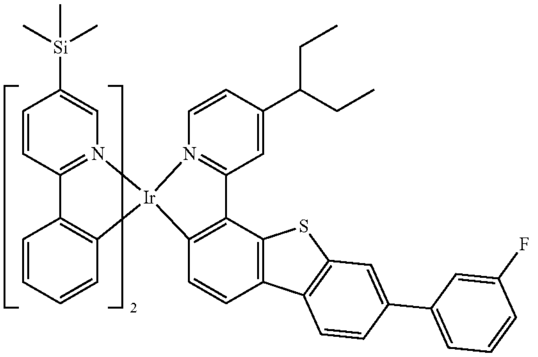
-continued
1033
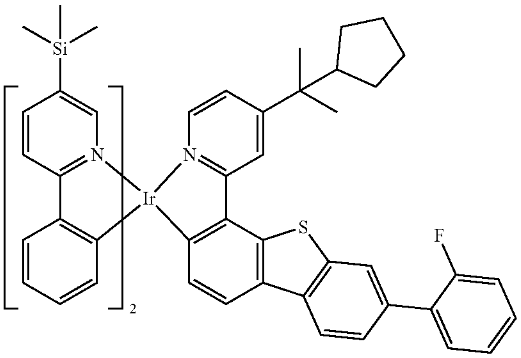
1034
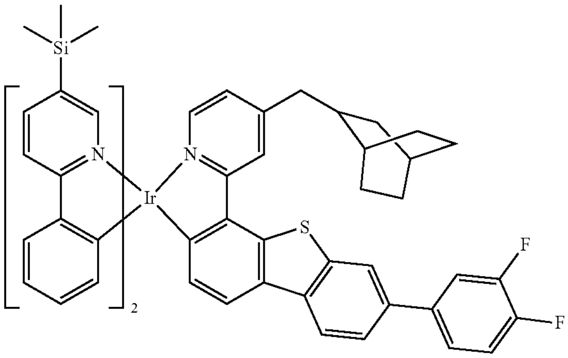
1035
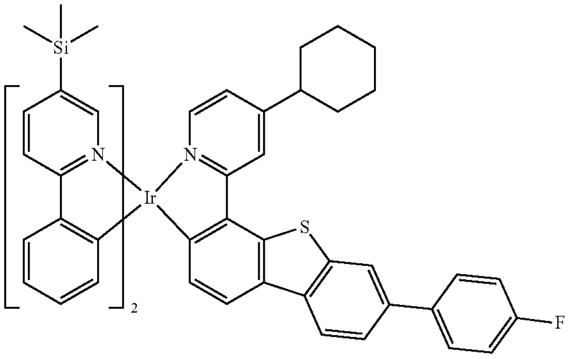
1036
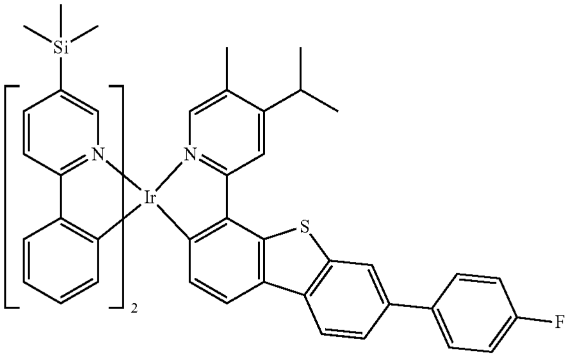

1037
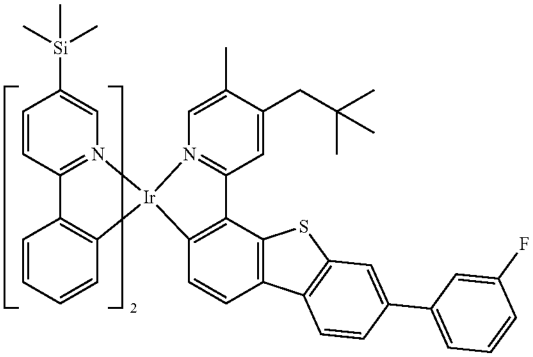
1038
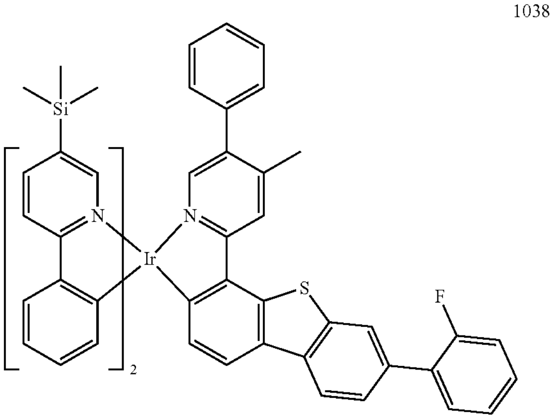
1039
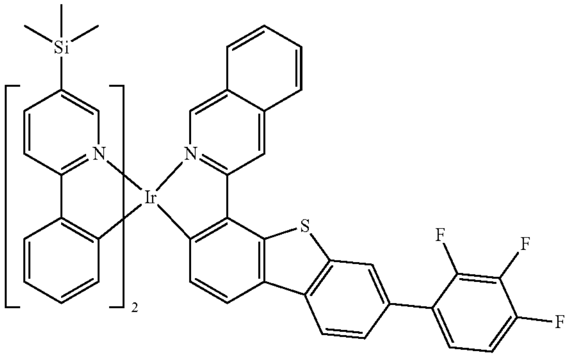
1040
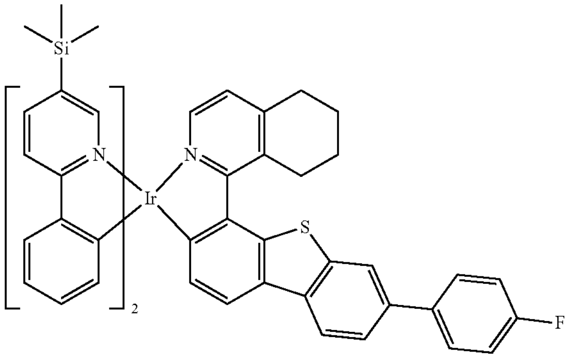
1041
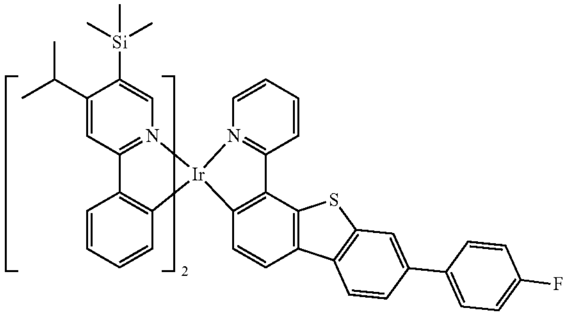
1042
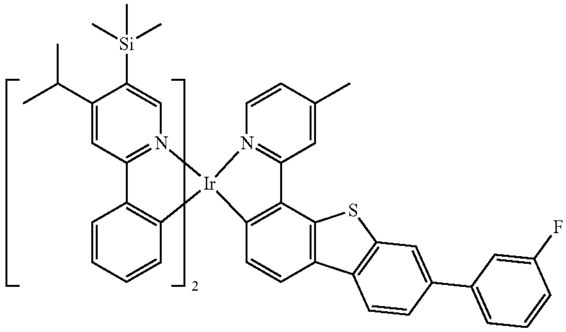
1043
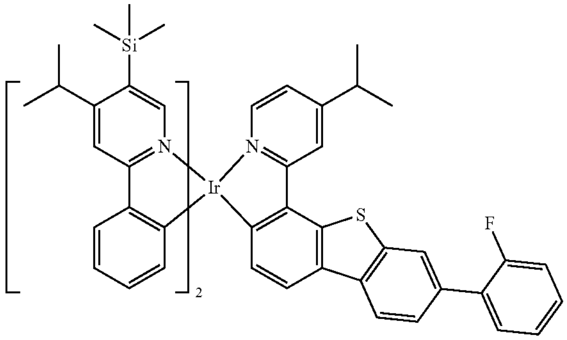
1044
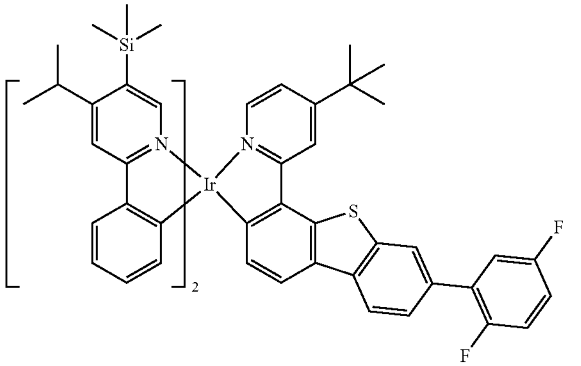

-continued
1045
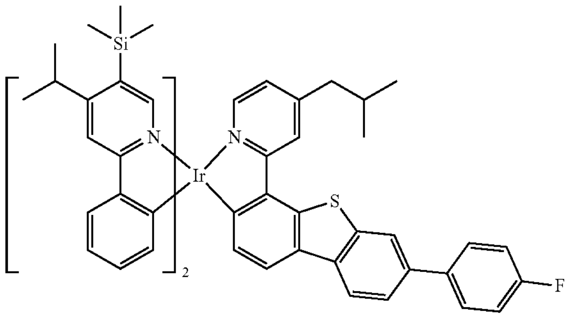
1046
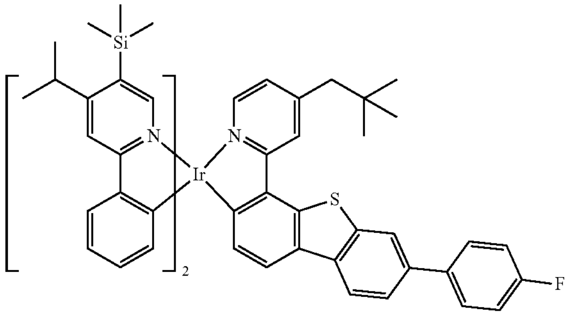
1047
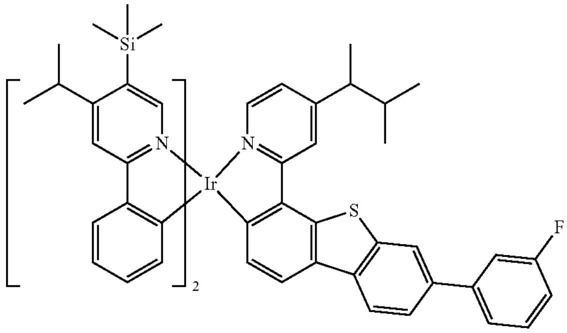
1048
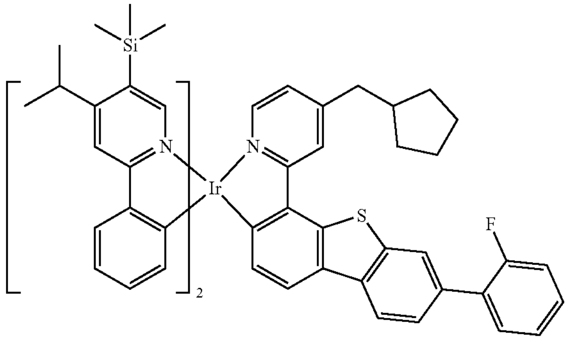
-continued
1049
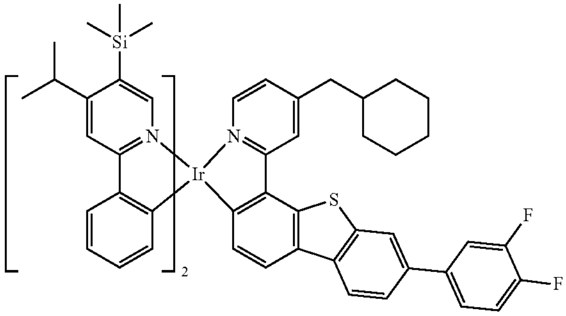
1050
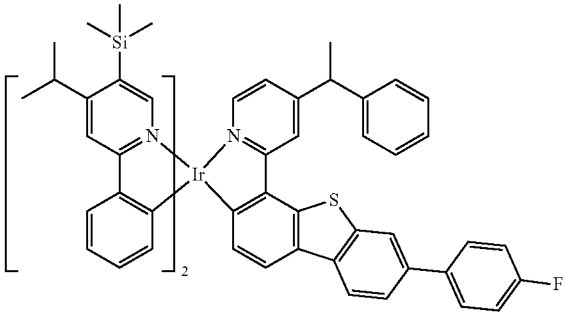
1051
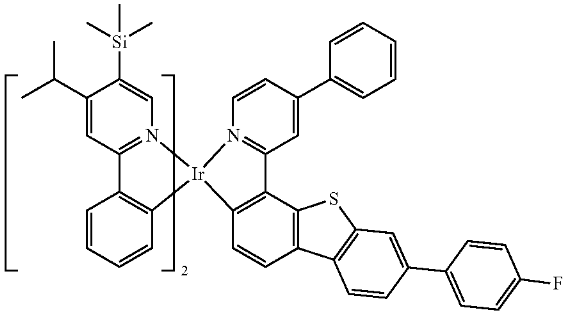
1052
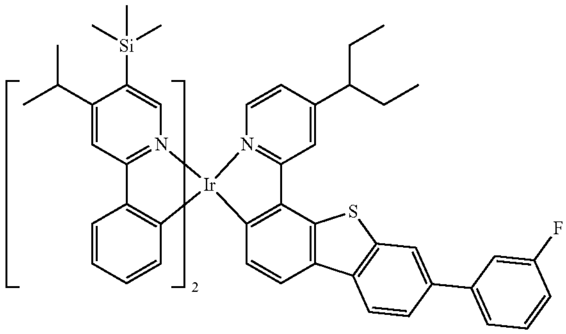

1053
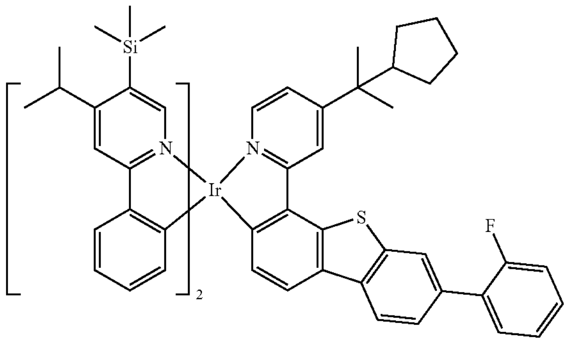
1054
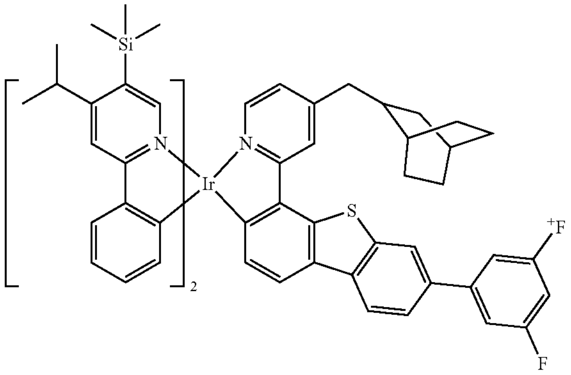
1055
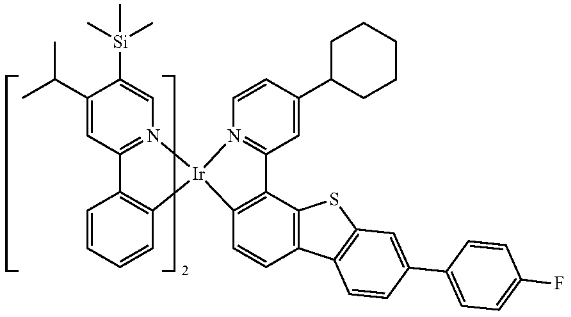
1056
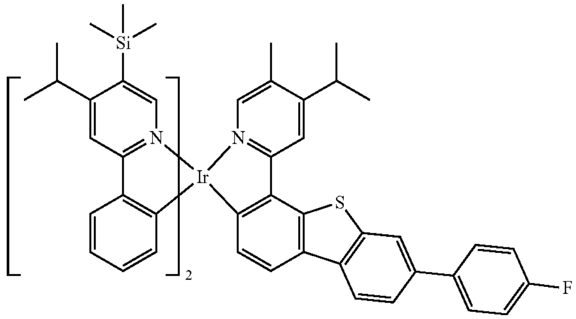
1057
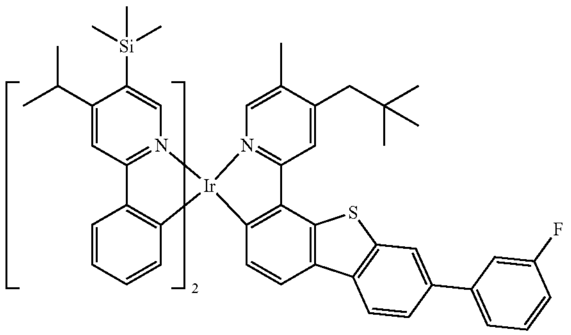
1058
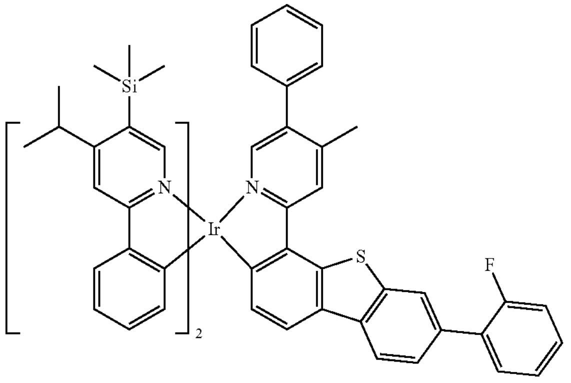
1059
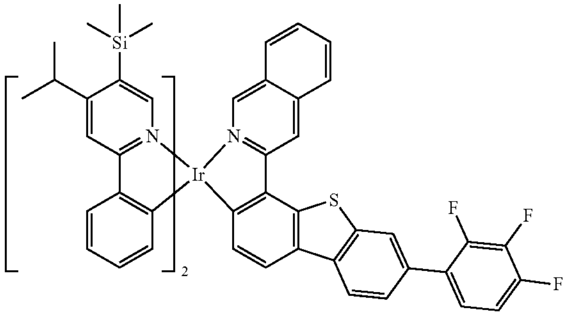
1060
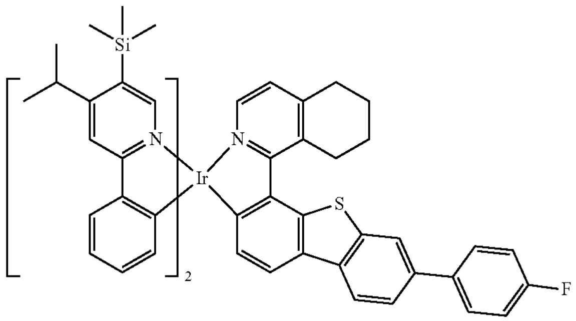

-continued
1061
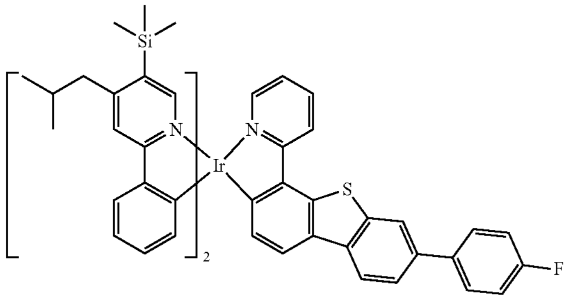
1062
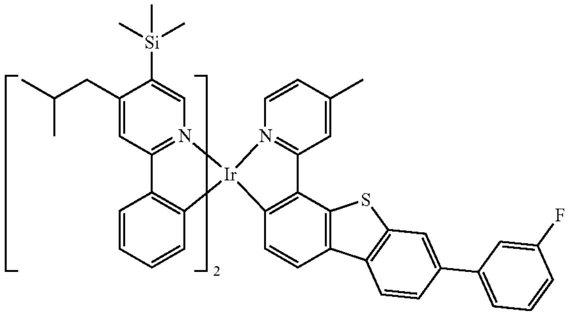
1063
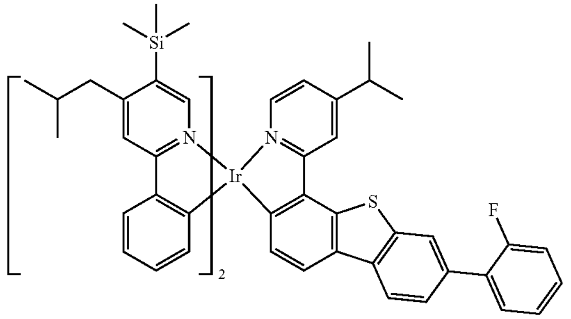
1064
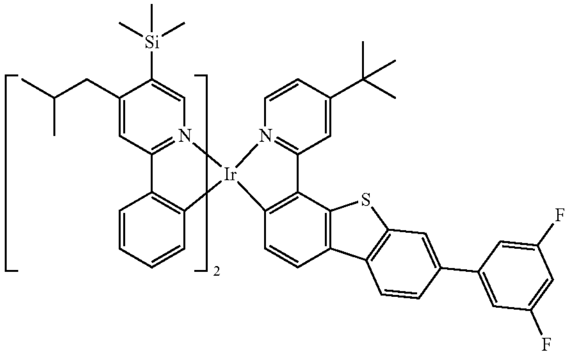
-continued
1065
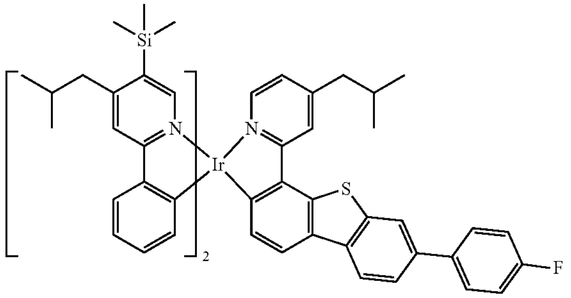
1066
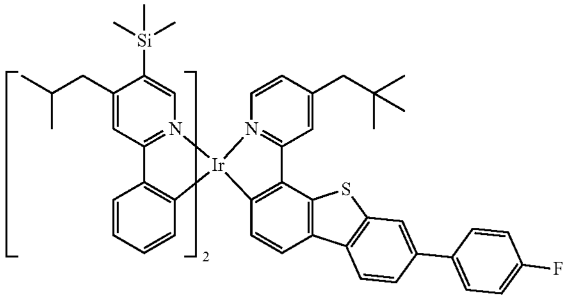
1067
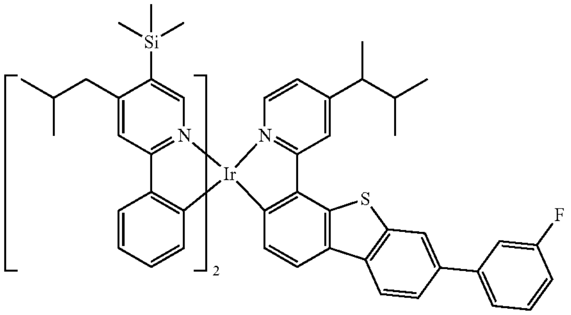
1068
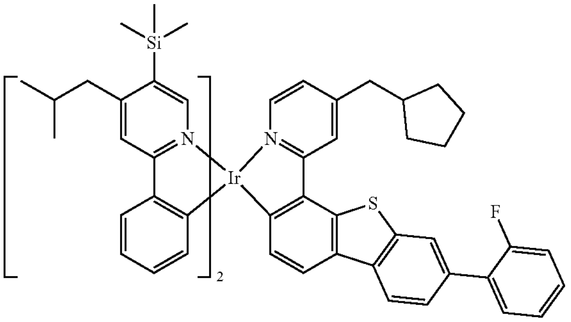

-continued
1069
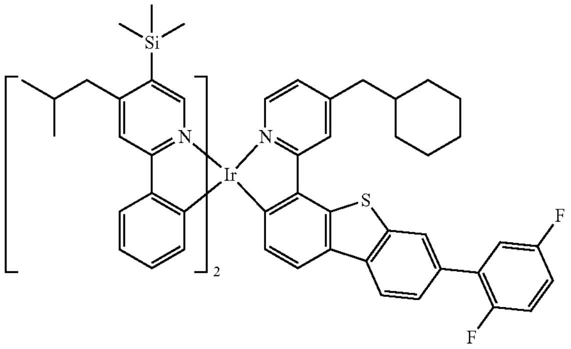
1070
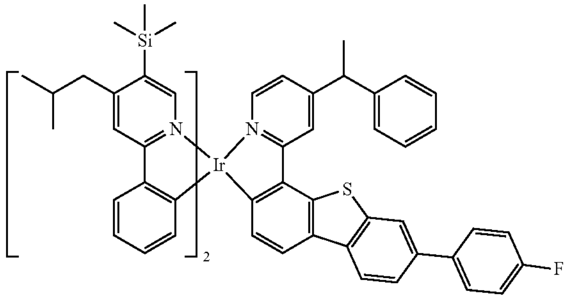
1071
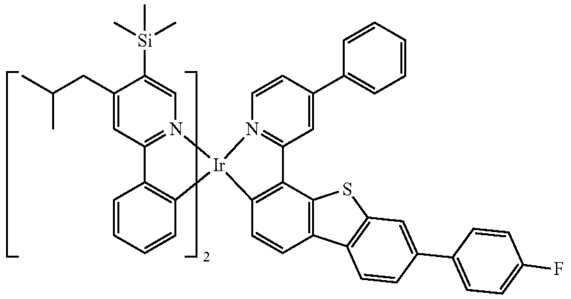
1072
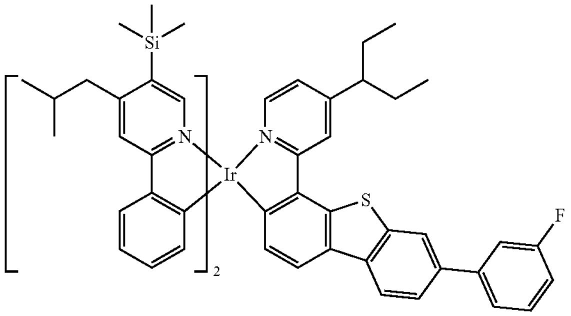
-continued
1073
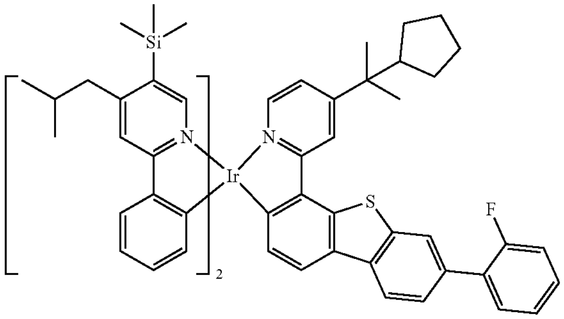
1074
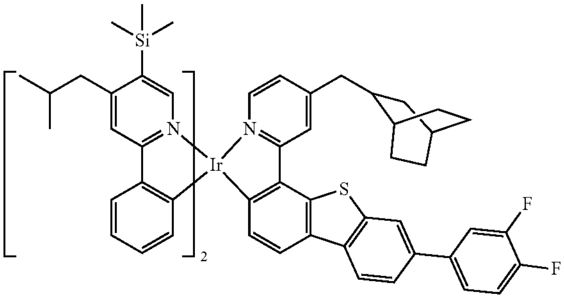
1075
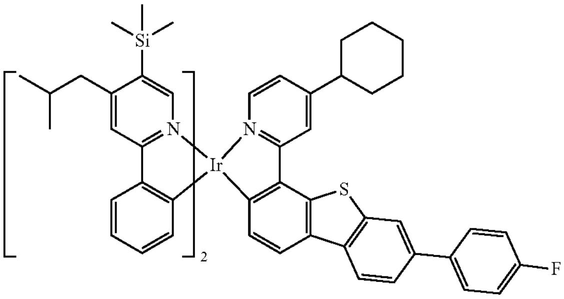
1076
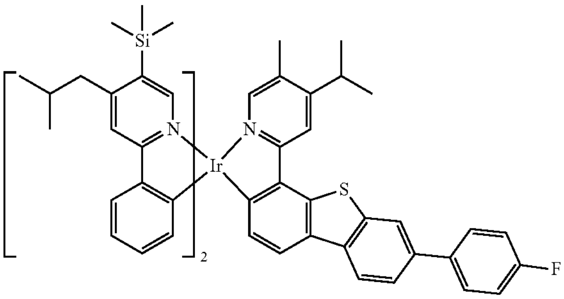

-continued
1077
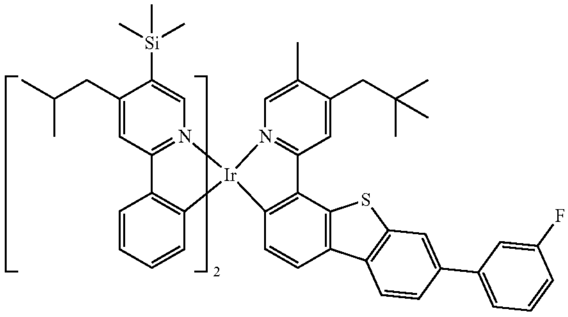
1078
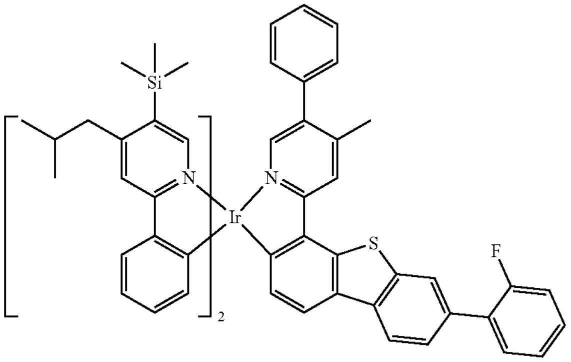
1079
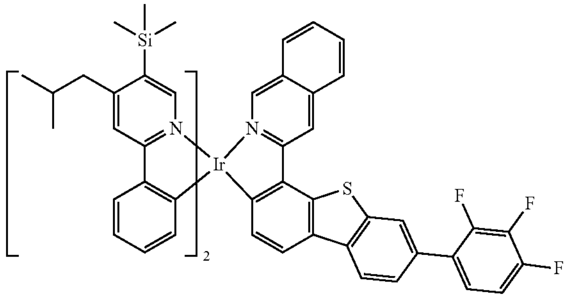
1080
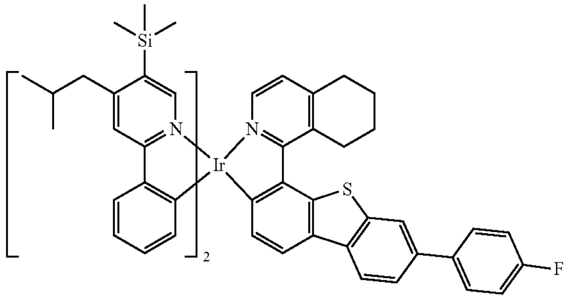
-continued
1081
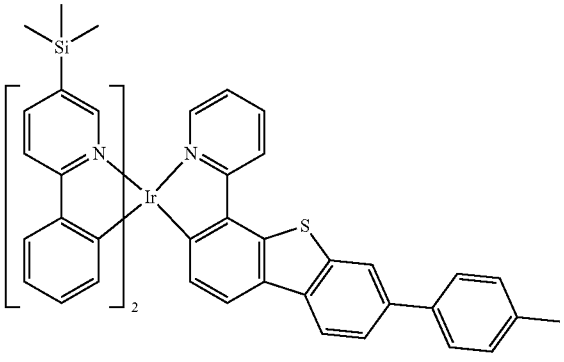
1082
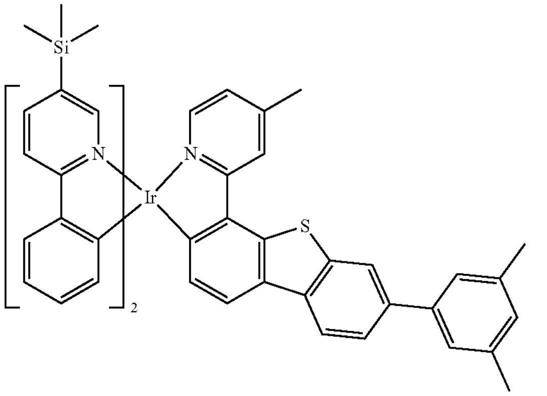
1083
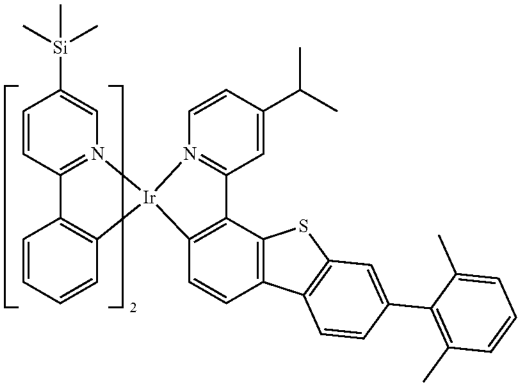
1084
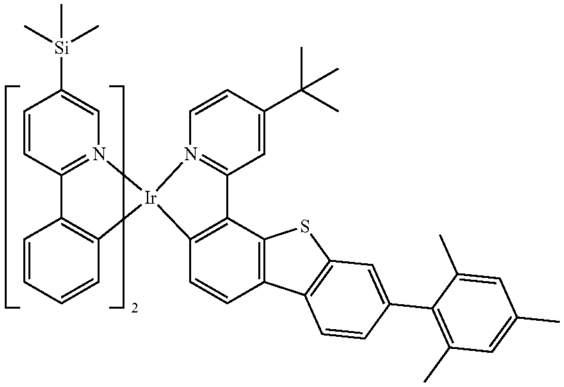

-continued
1085
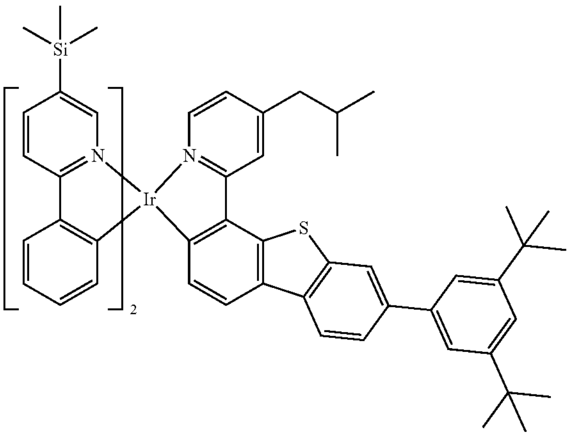
1086
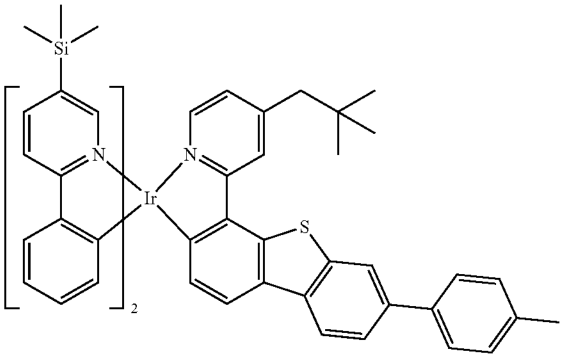
1087
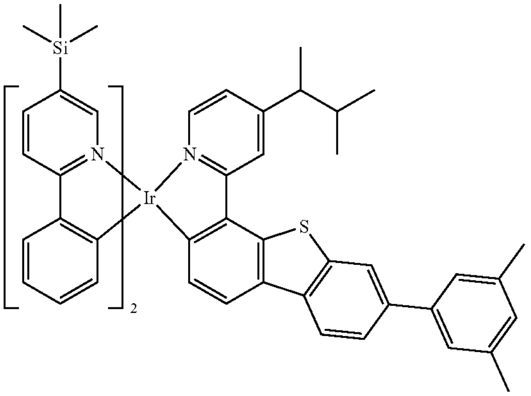
1088
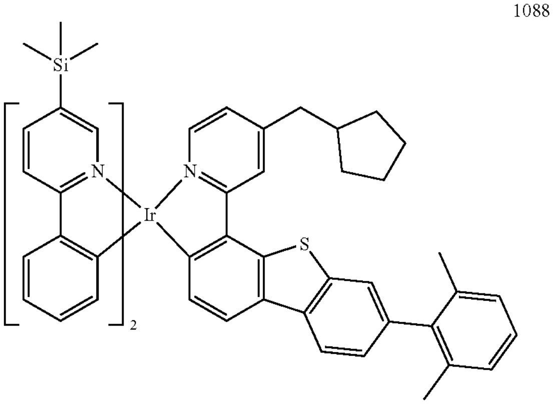
-continued
1089
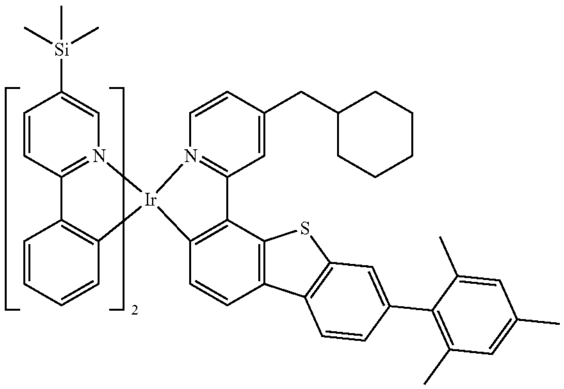
1090
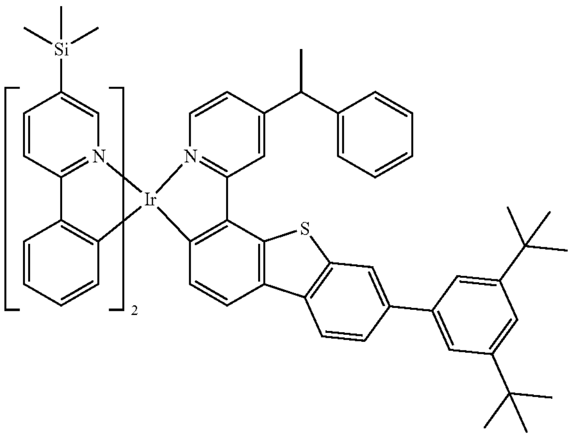
1091
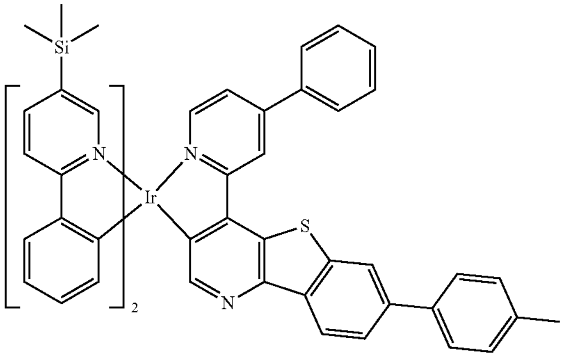

-continued
1092
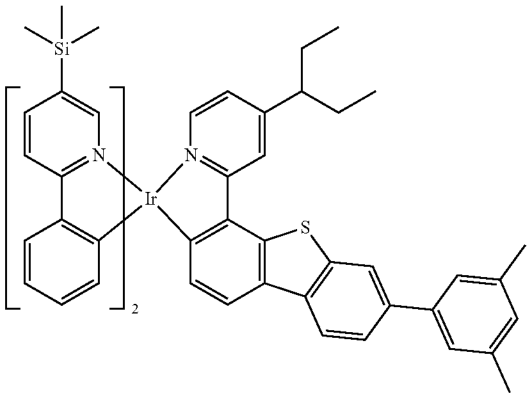
1093
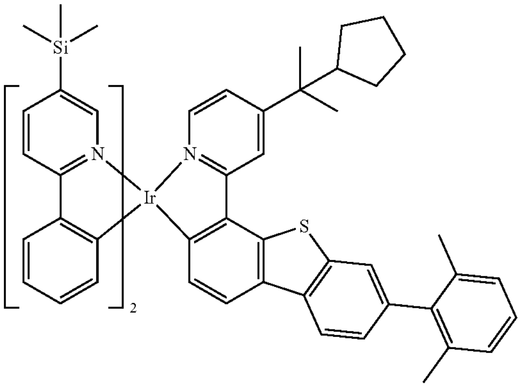
1094
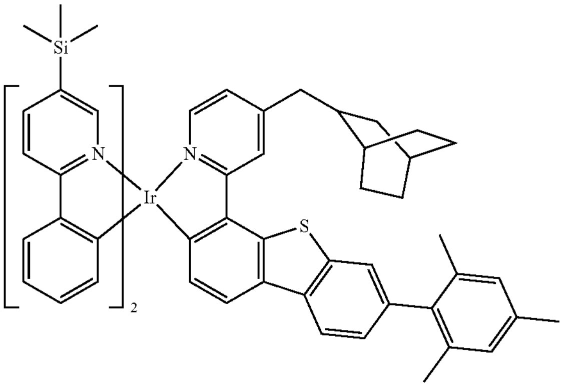
-continued
1095
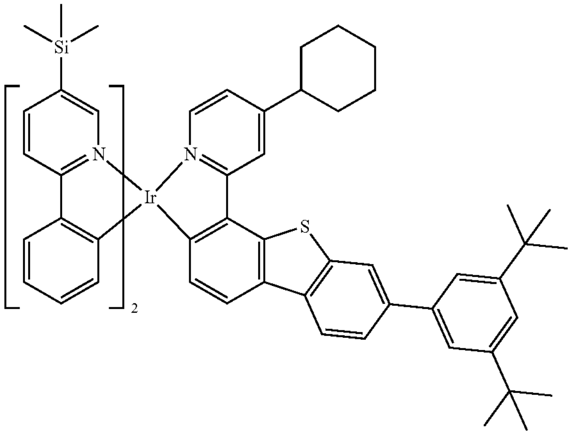
1096
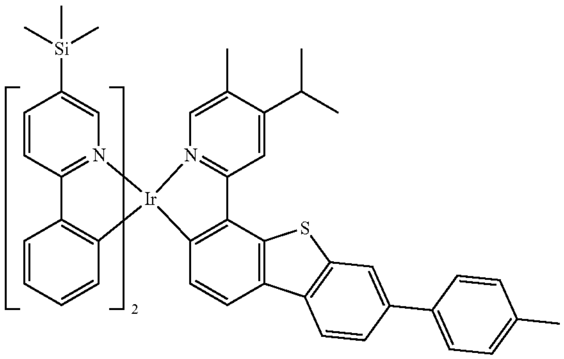
1097
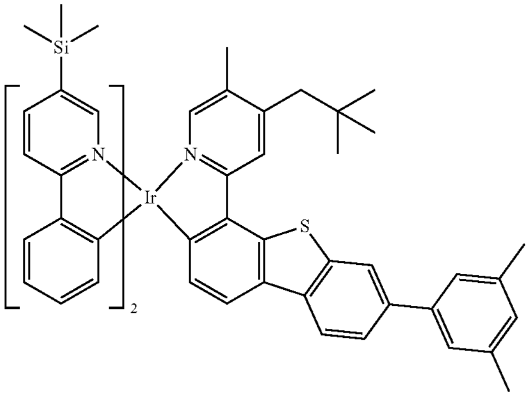

-continued
1098
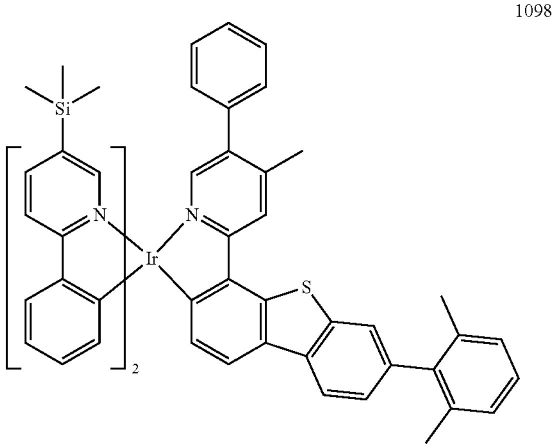
1099
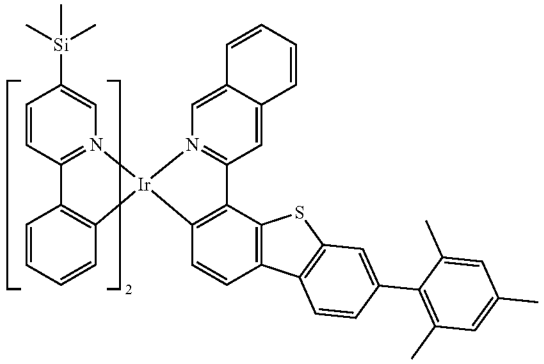
1100
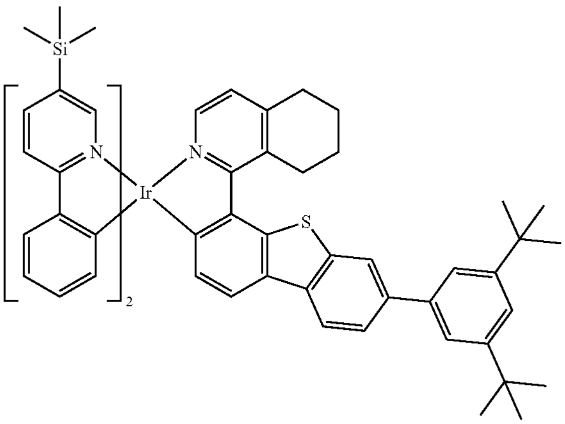
-continued
1101
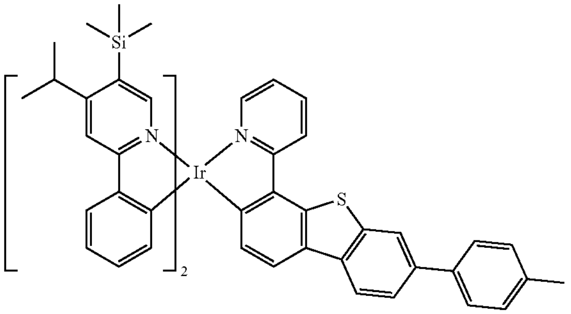
1102
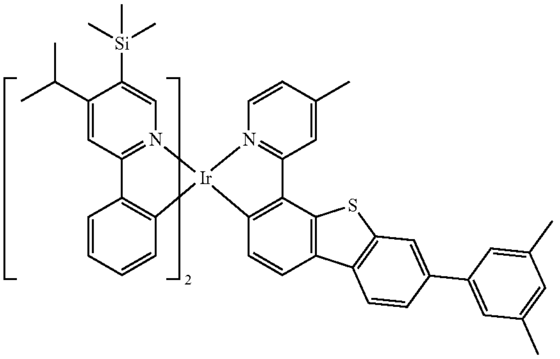
1103
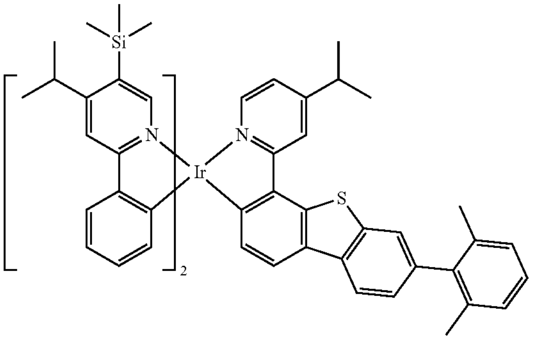
1104
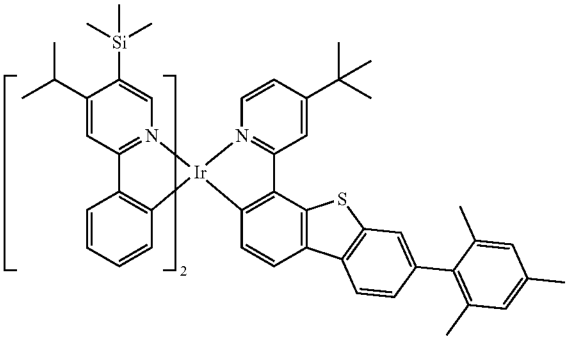

-continued
1105
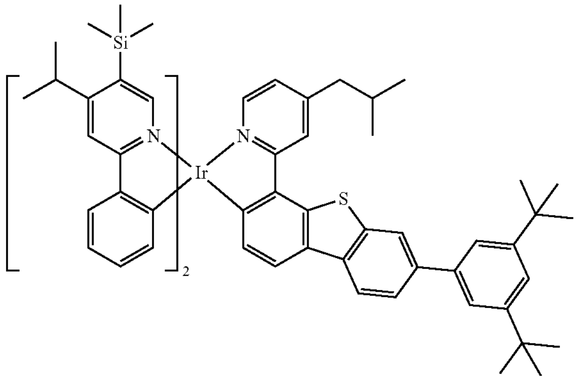
1106
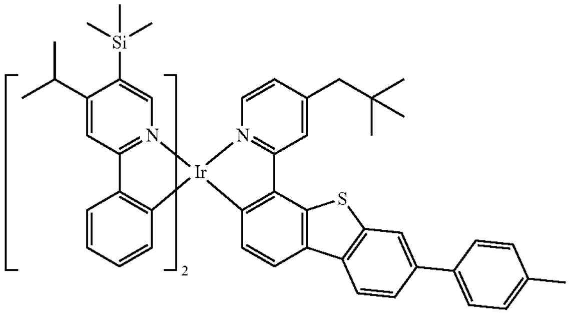
1107
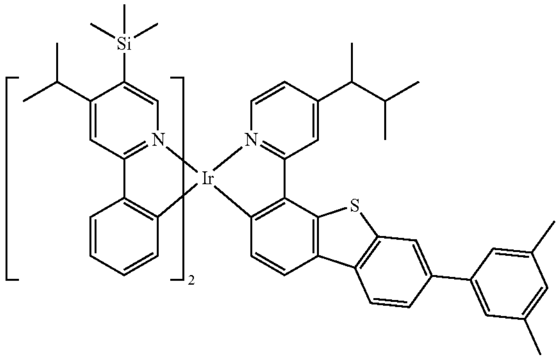
1108
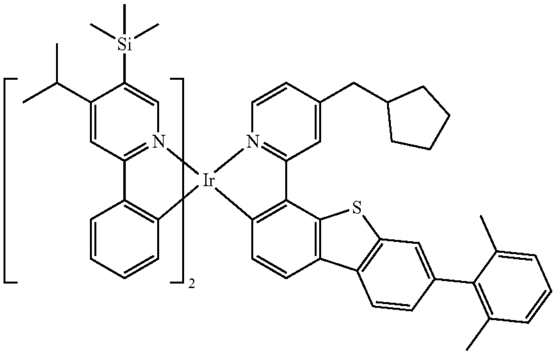
-continued
1109
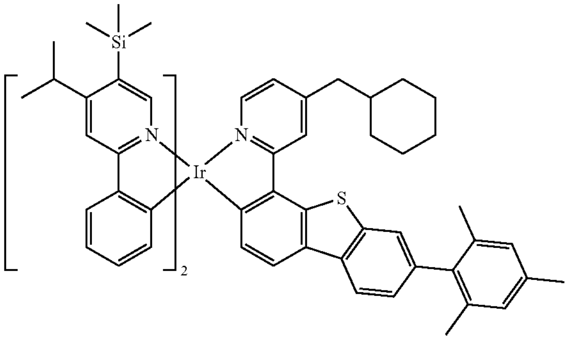
1110
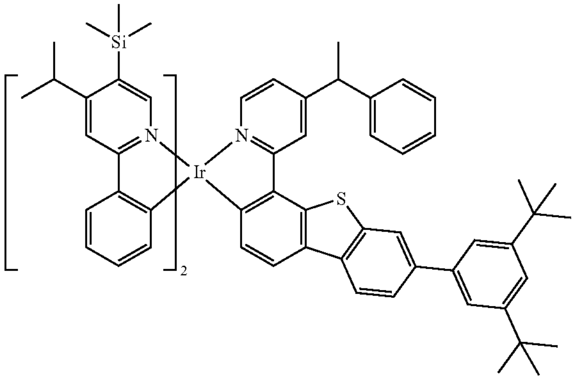
1111
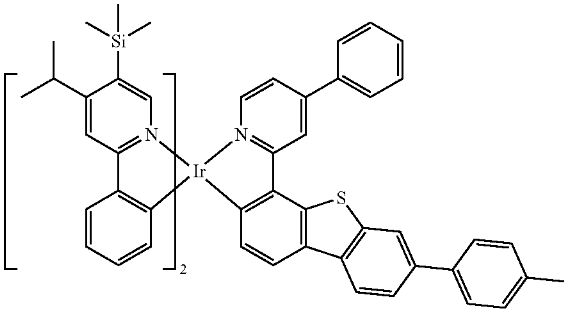
1112
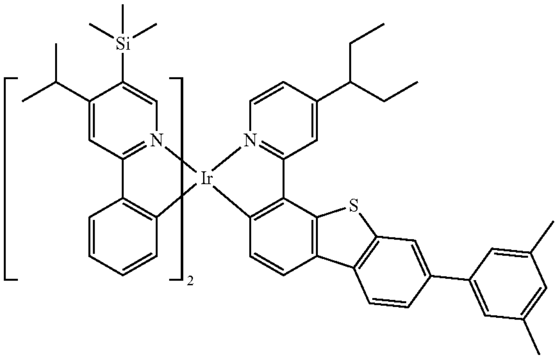

-continued
1113
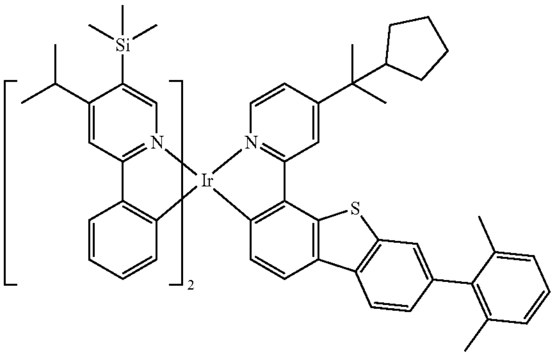
1114
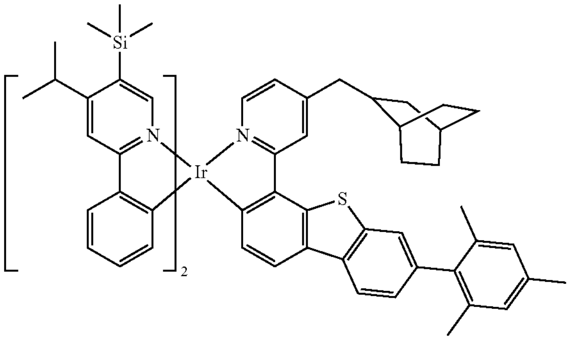
1115
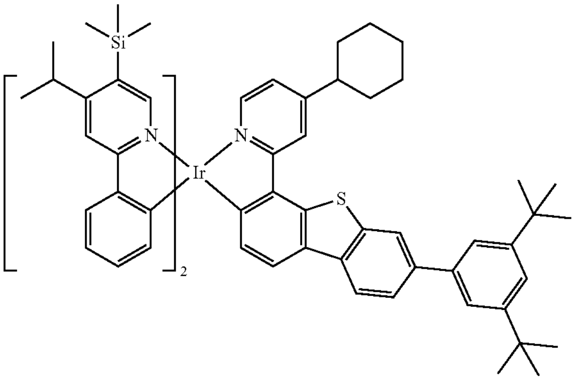
1116
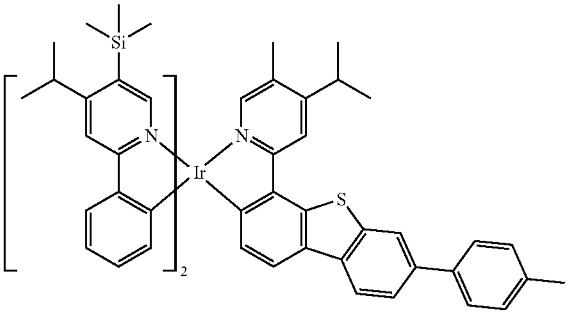
-continued
1117
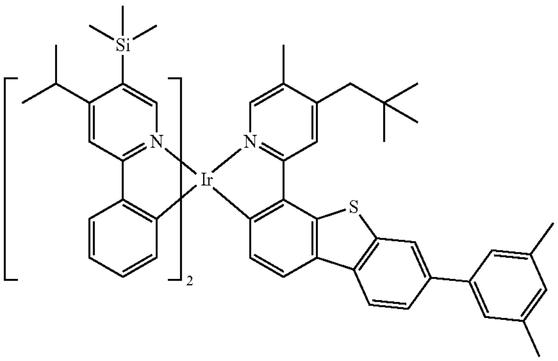
1118
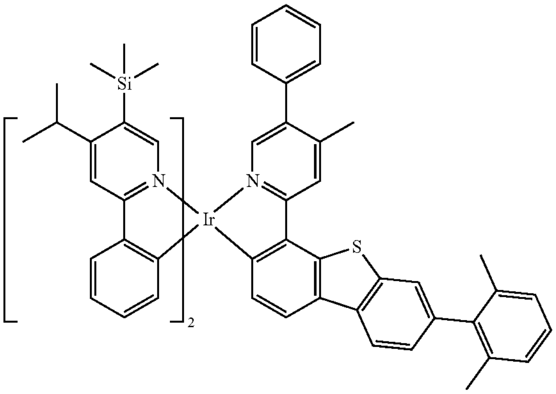
1119
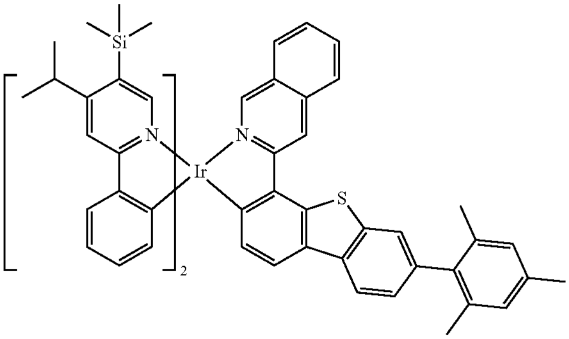
1120
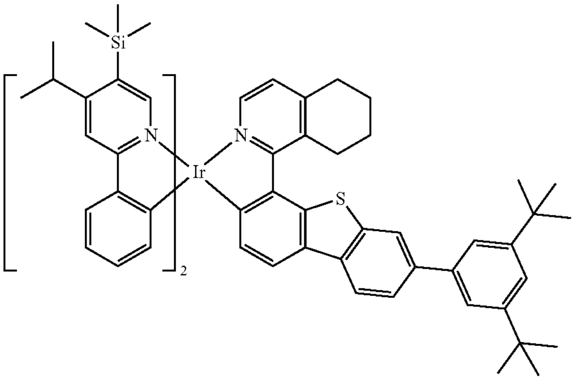

-continued
1121
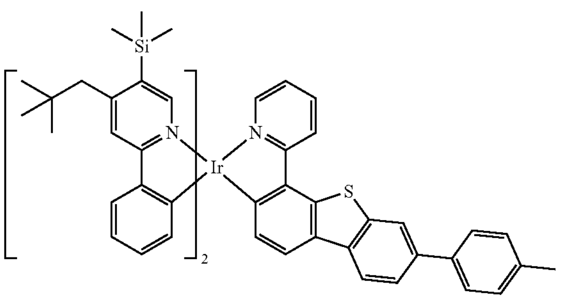
1122
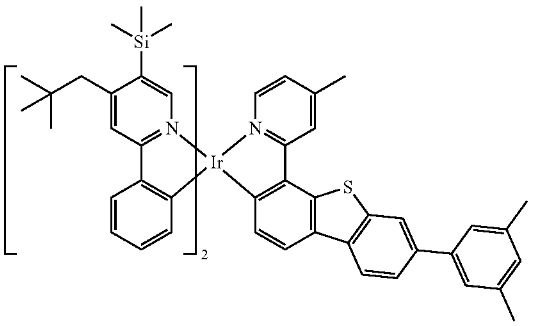
1123
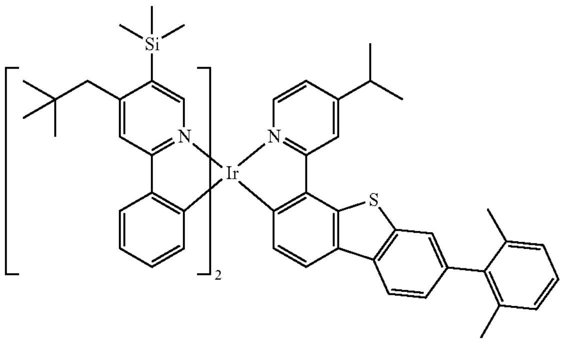
1124
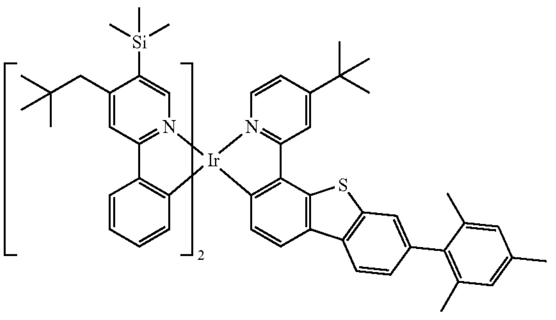
-continued
1125
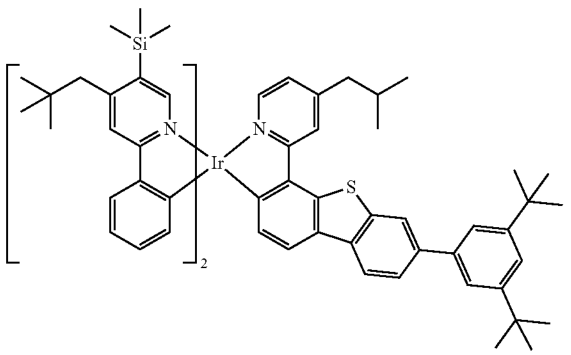
1126
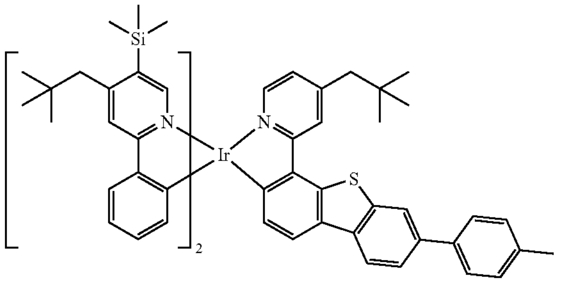
1127
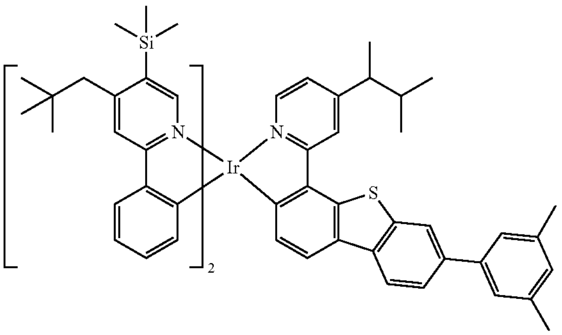
1128
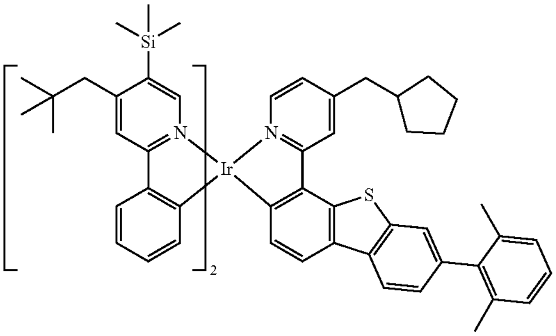

1129
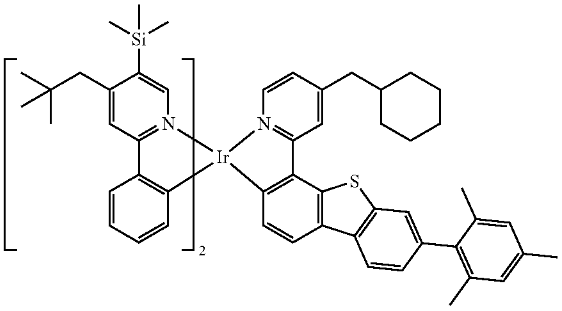
1130
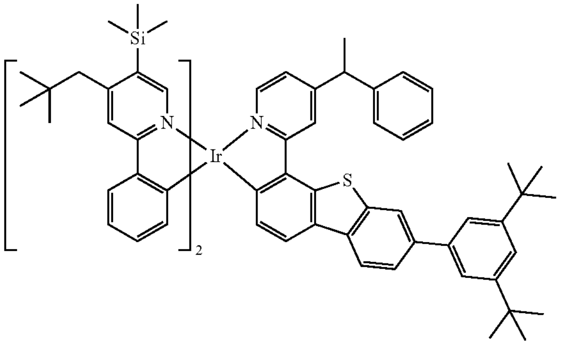
1131
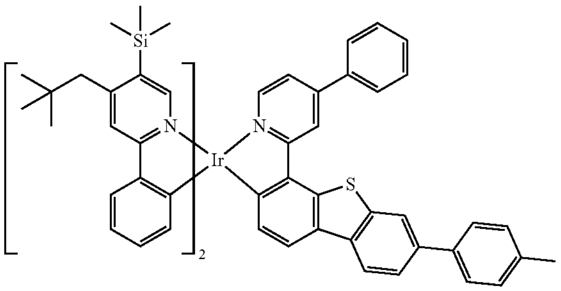
1132
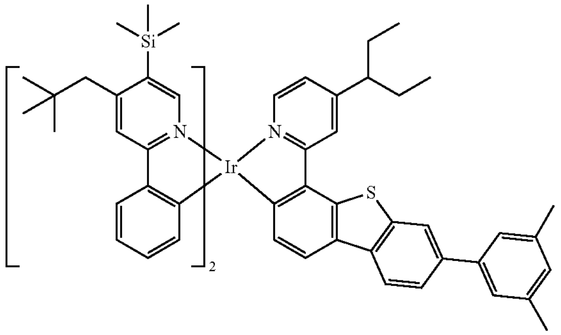
1133
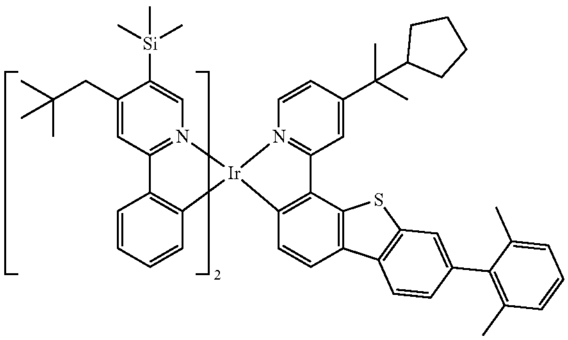
1134
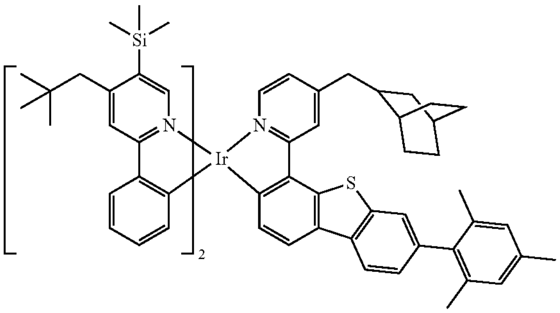
1135
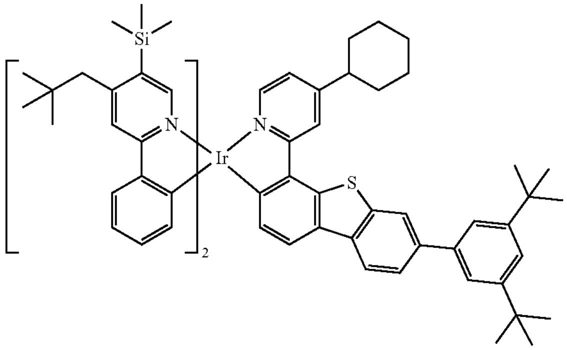
1136
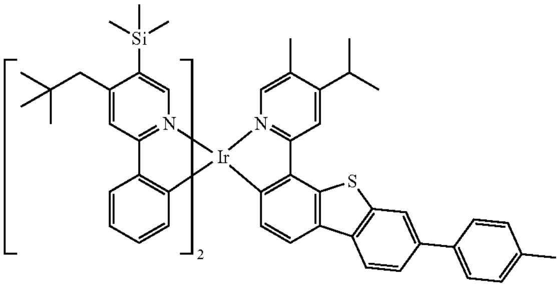

-continued
1137
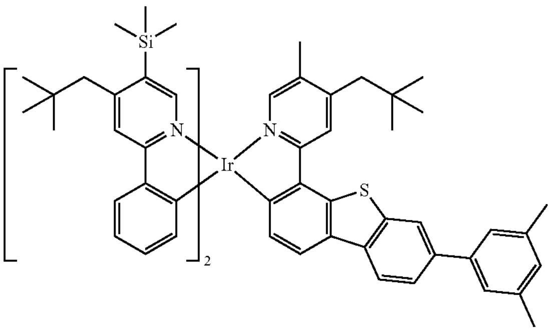
1138
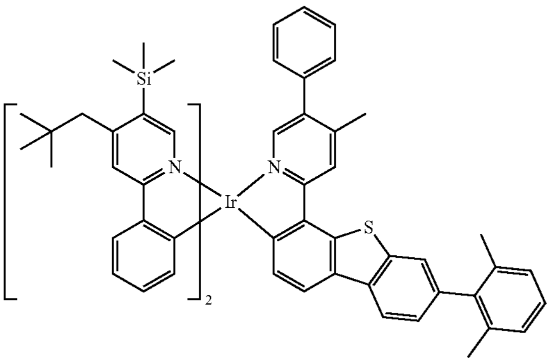
1139
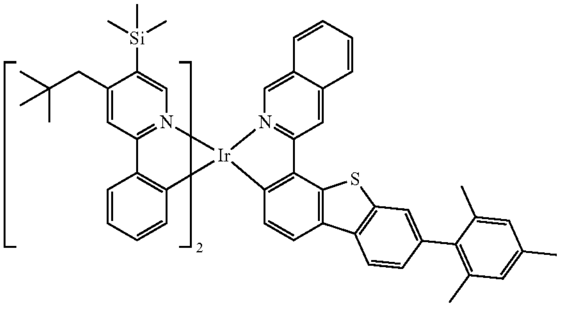
1140
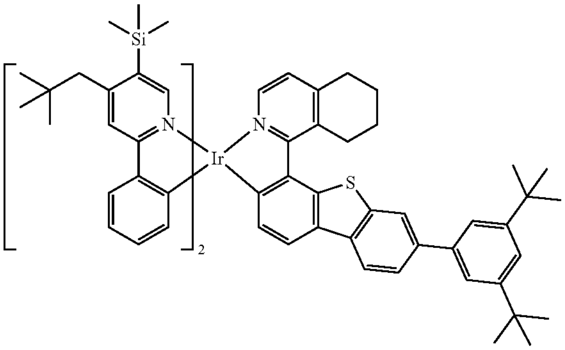
-continued
1141
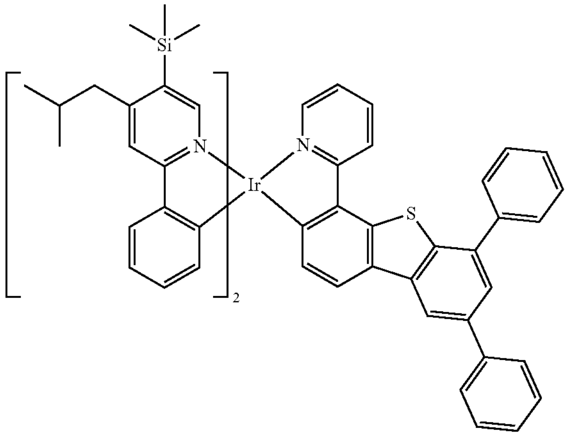
1142
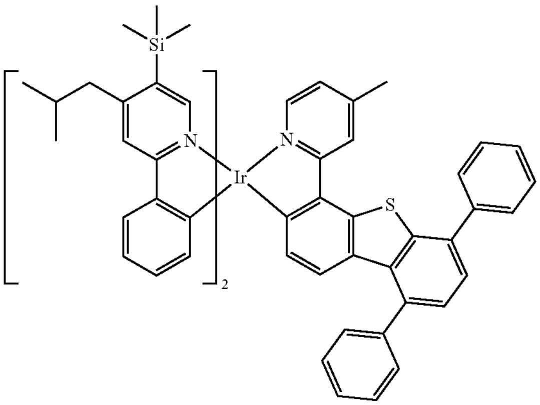
1143
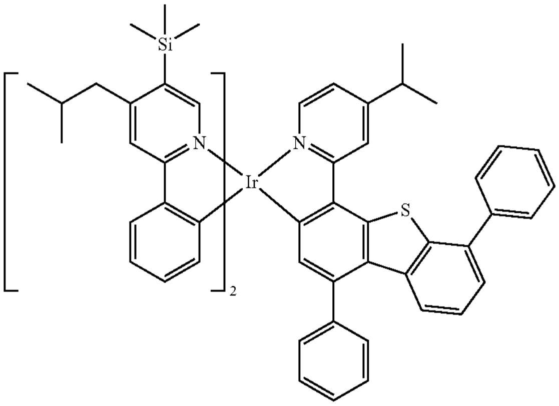

-continued
1144
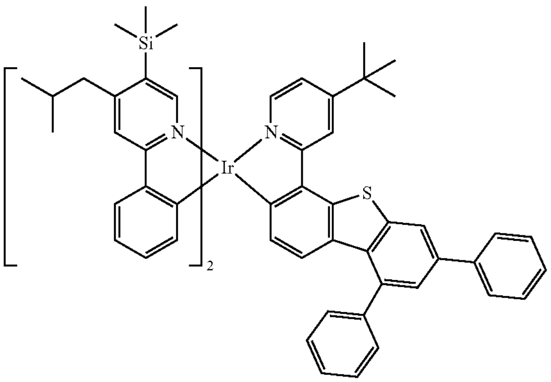
1145
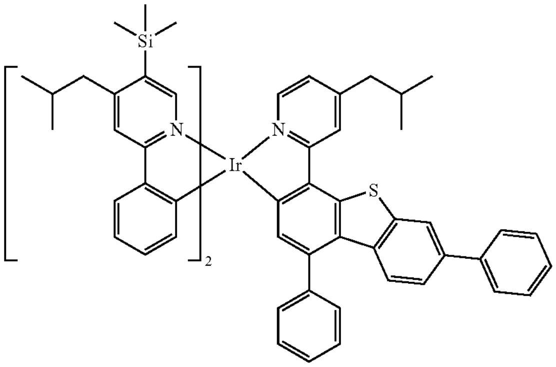
1146
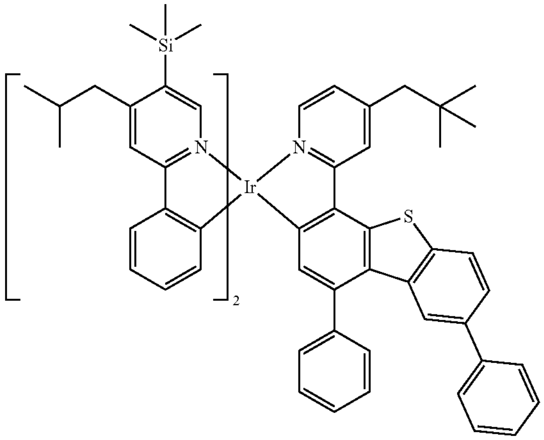
1147
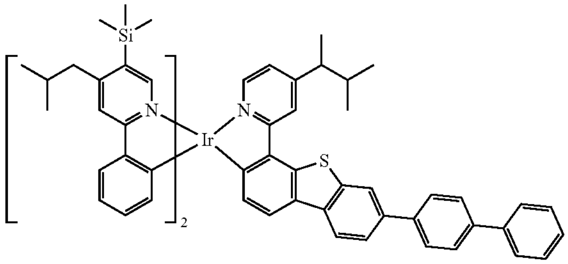
-continued
1148
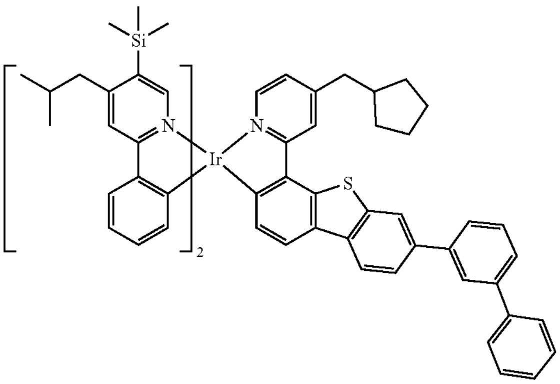
1149
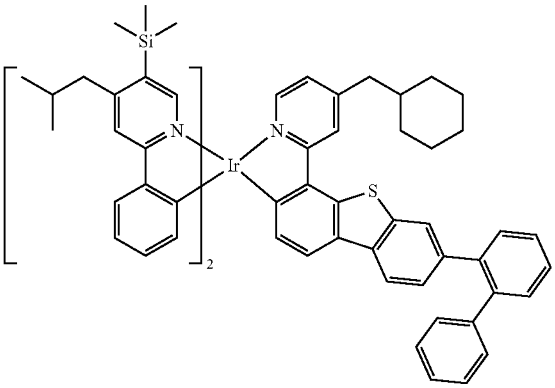
1150
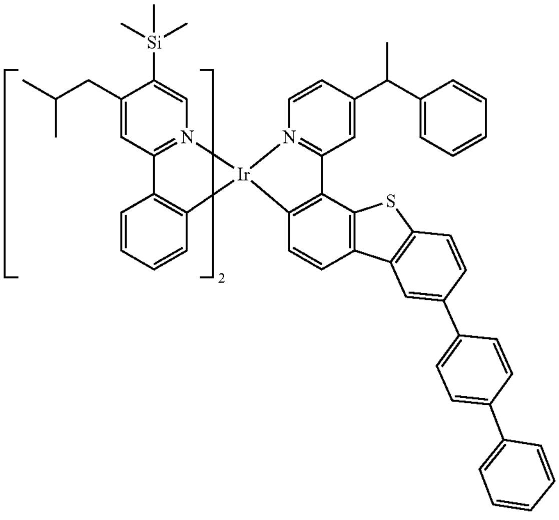

-continued
1151
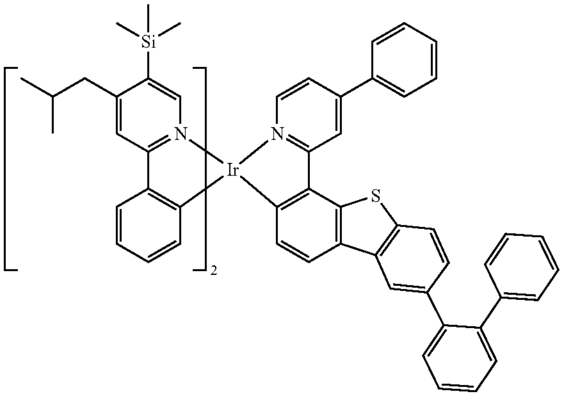
1152
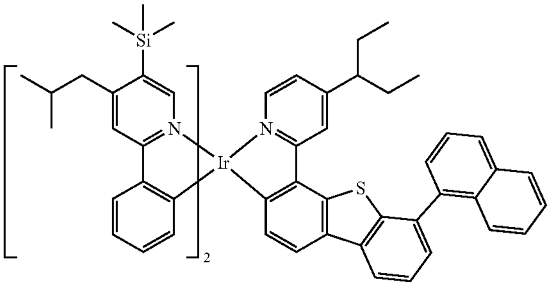
1153
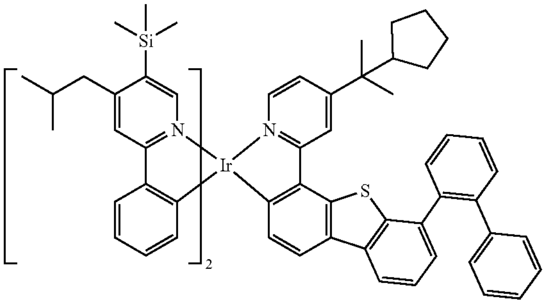
1154
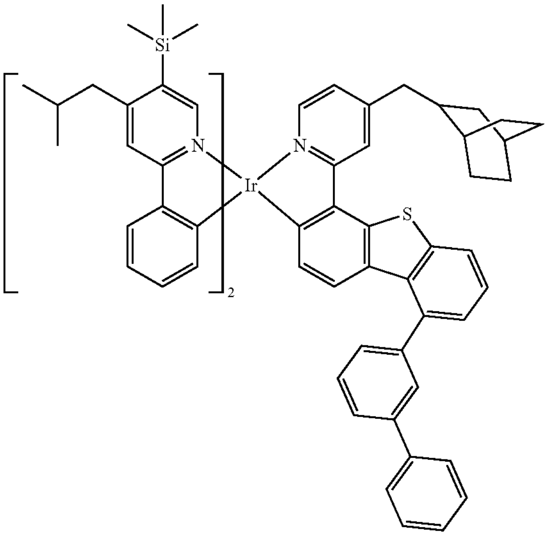
-continued
1155
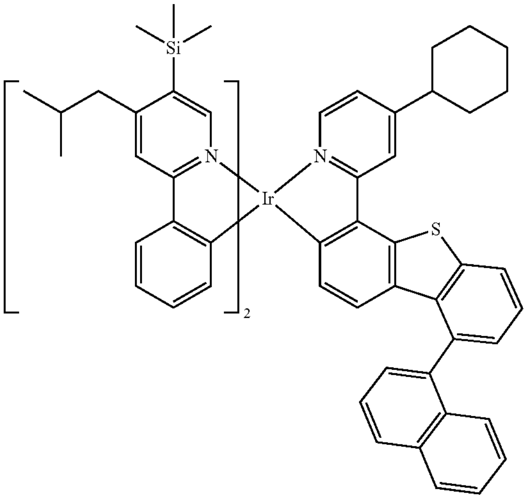
1156
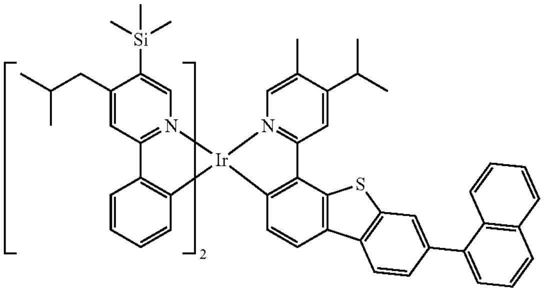
1157
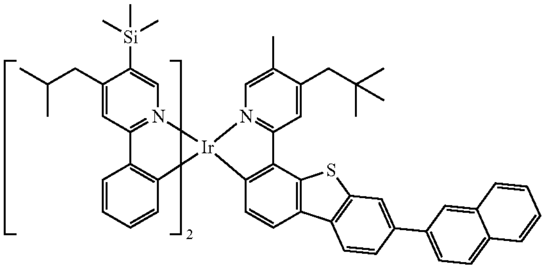
1158
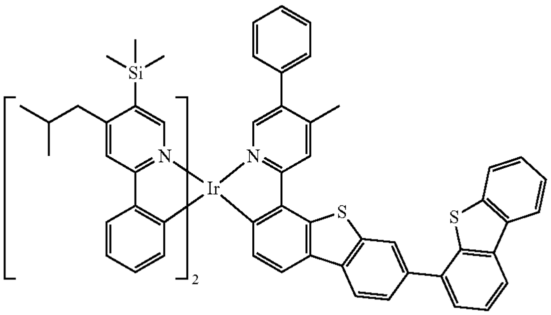

-continued
1159
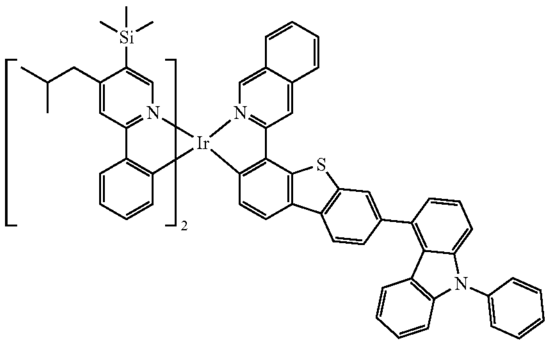
1160
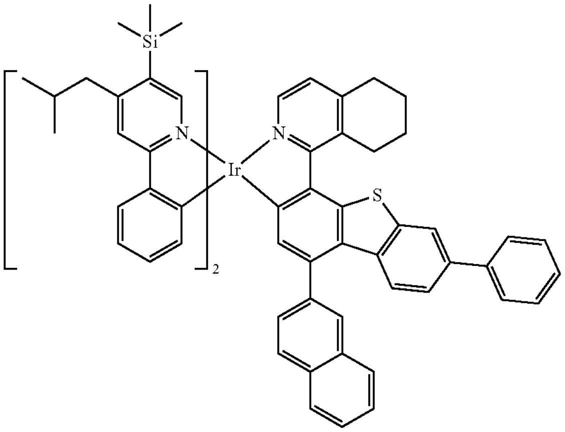
1161
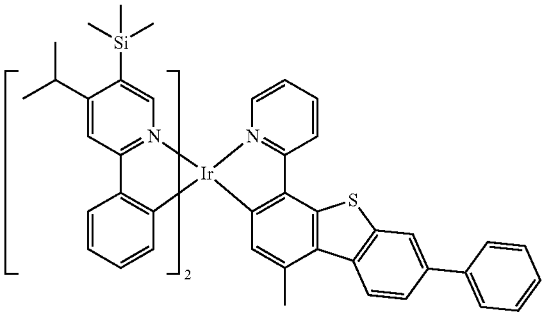
1162
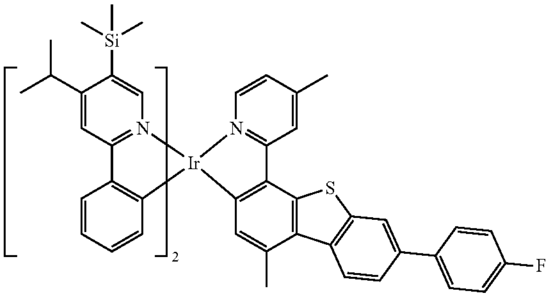
-continued
1163
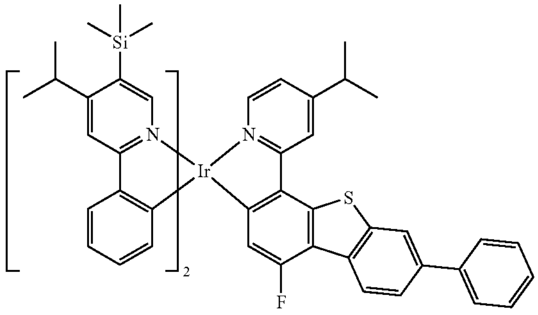
1164
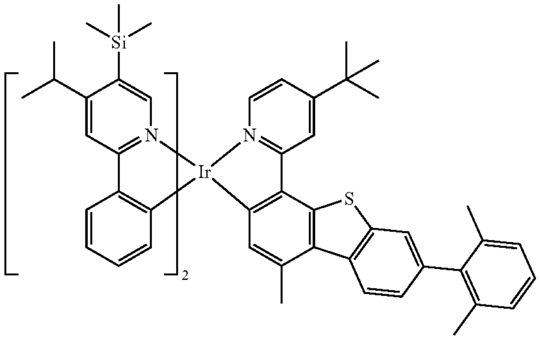
1165
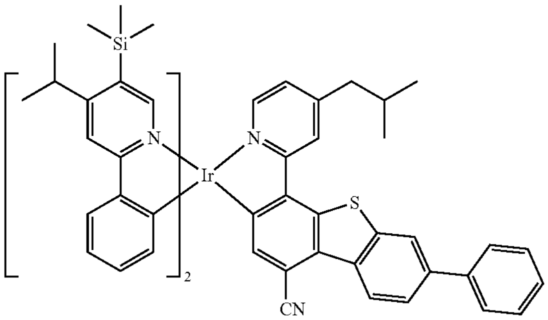
1166
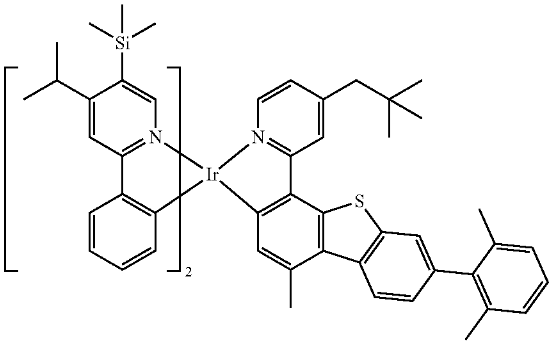

-continued
1167
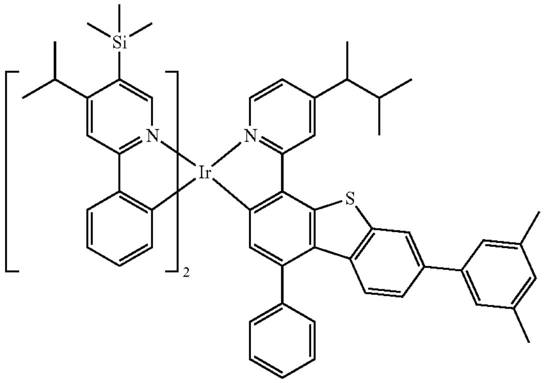
1168
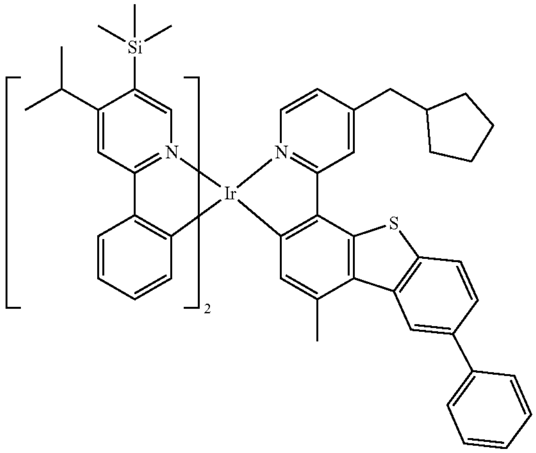
1169
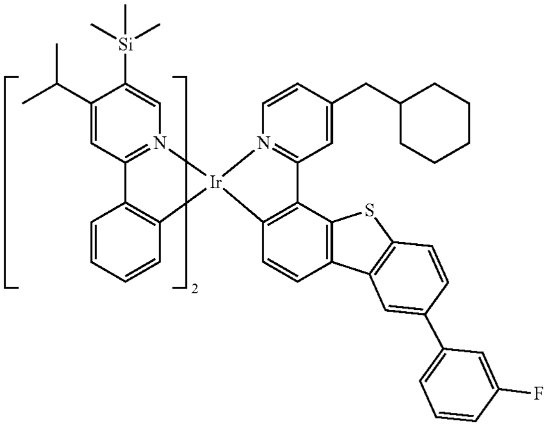
-continued
1170
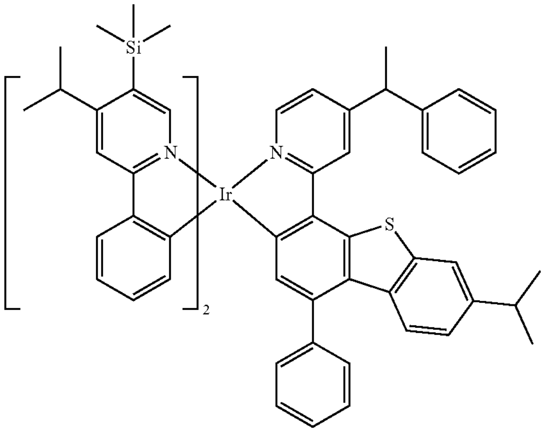
1171
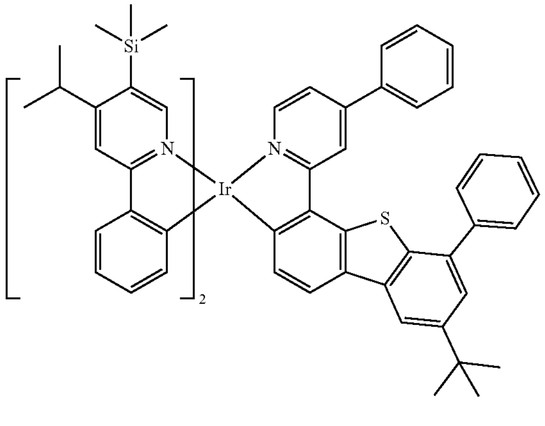
1172
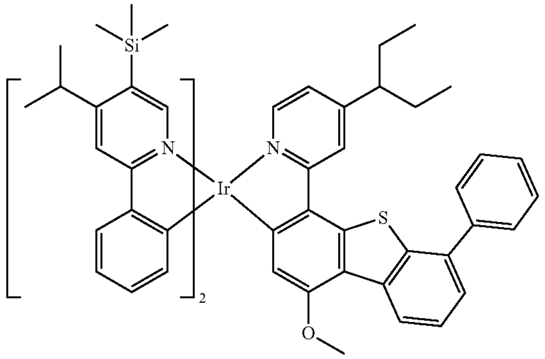

-continued
1173
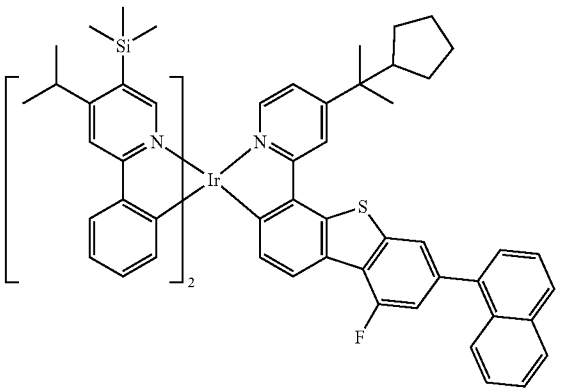
1174
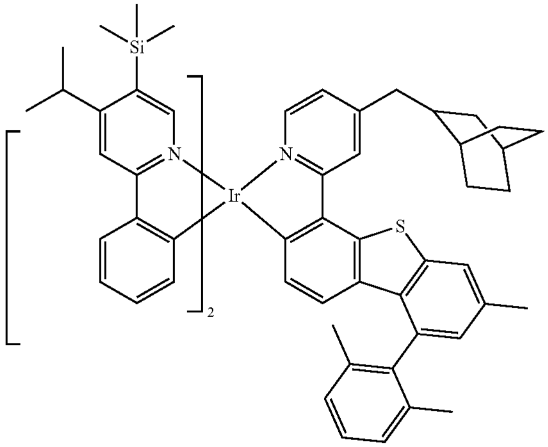
1175
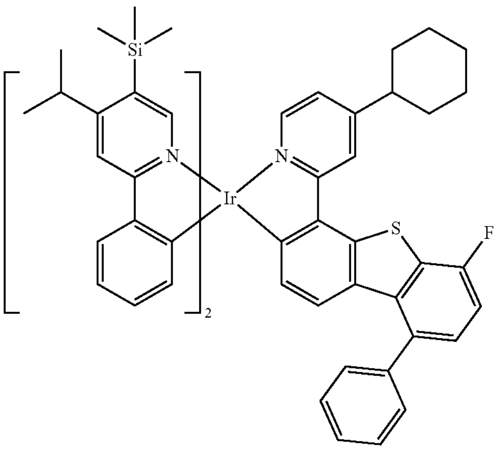
-continued
1176
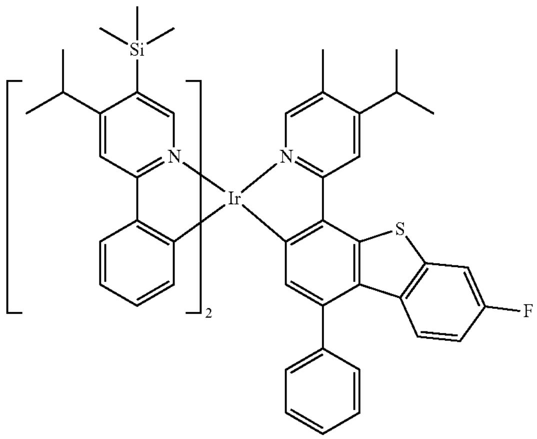
1177
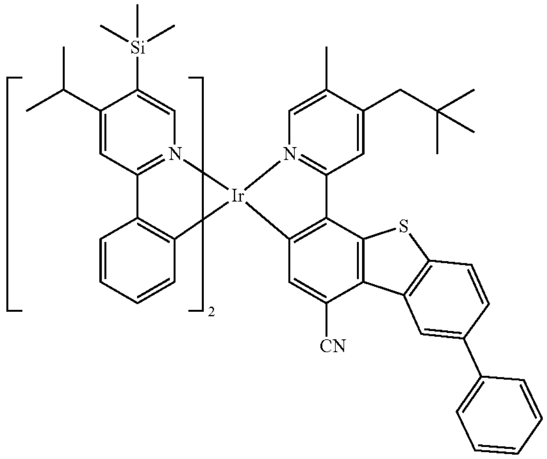
1178
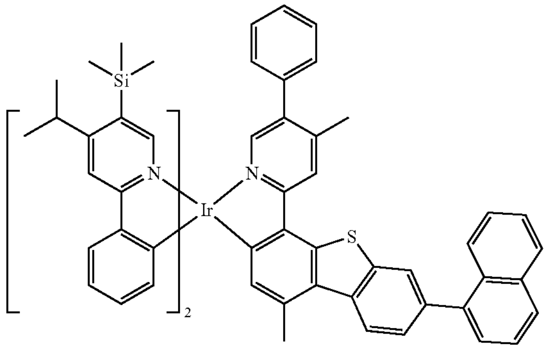

1179
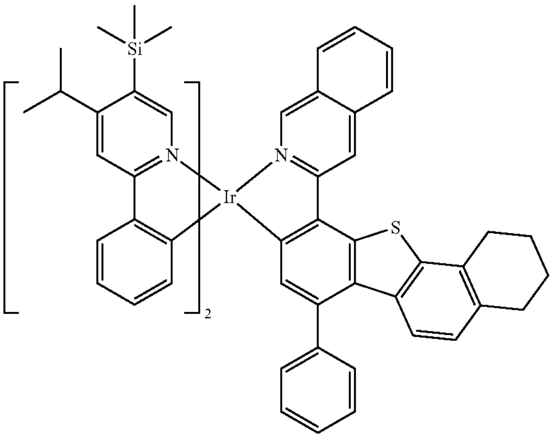
1180
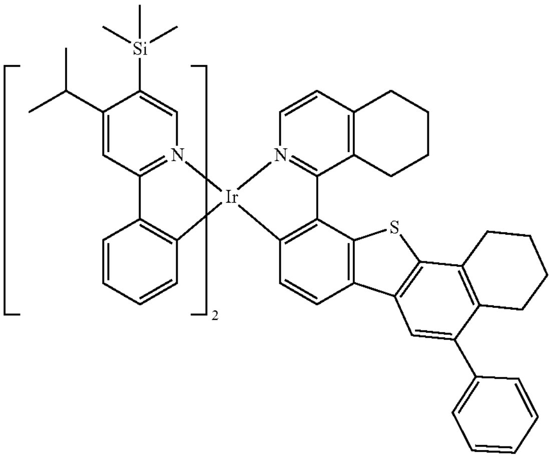
1181
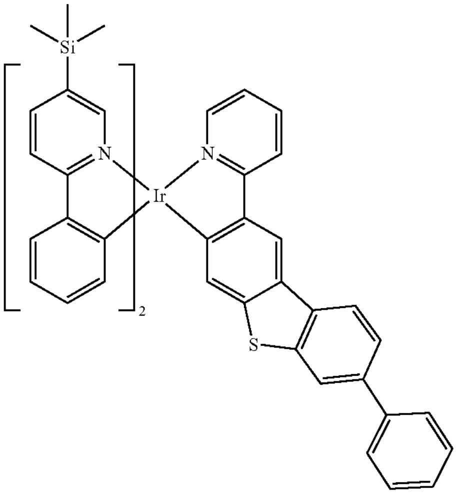
1182
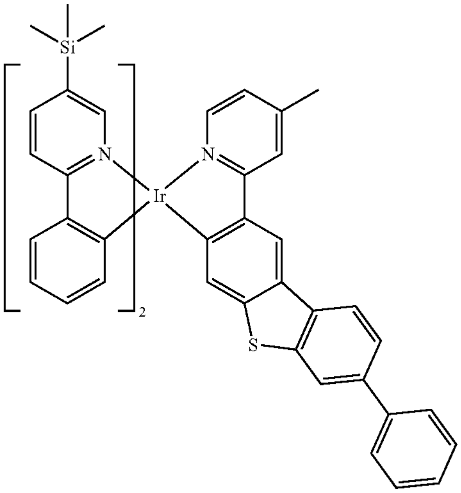
1183
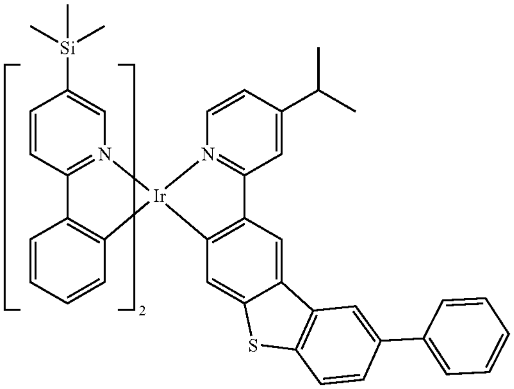
1184
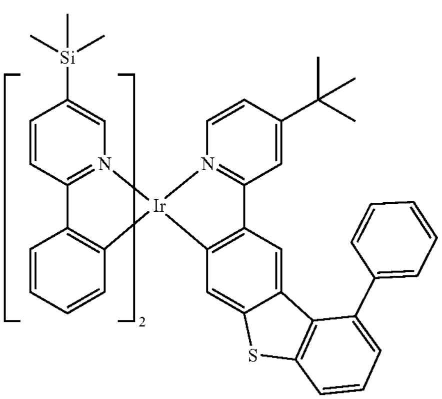

-continued
1185
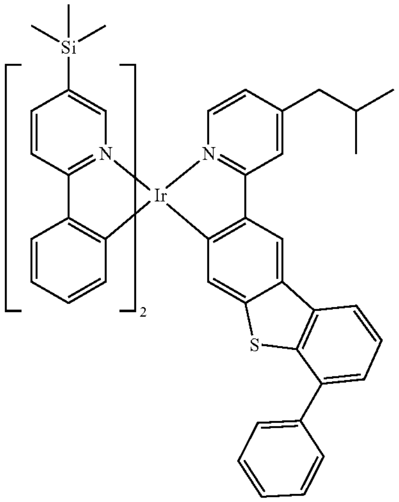
1186
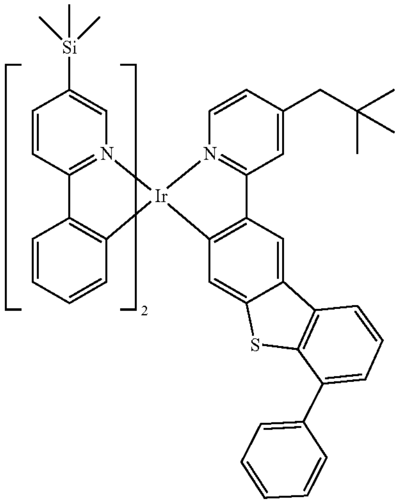
1187
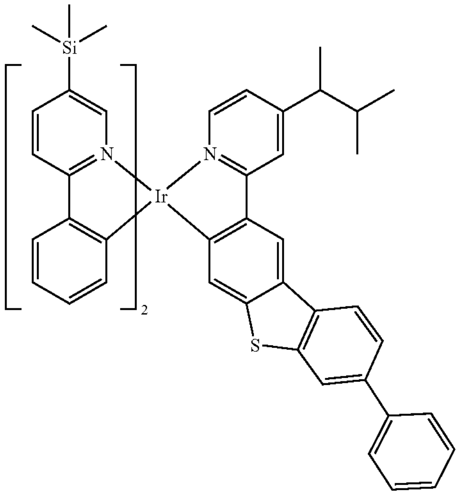
-continued
1188
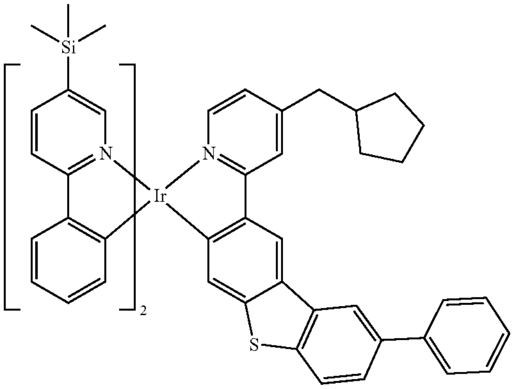
1189
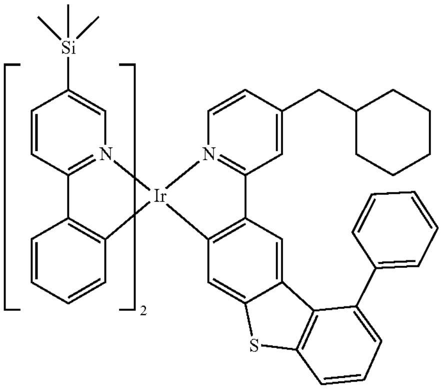
1190
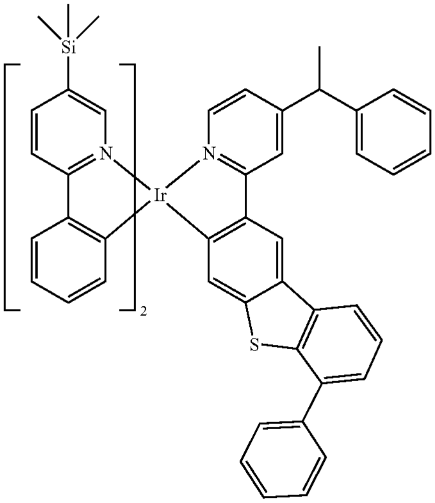

-continued
1191
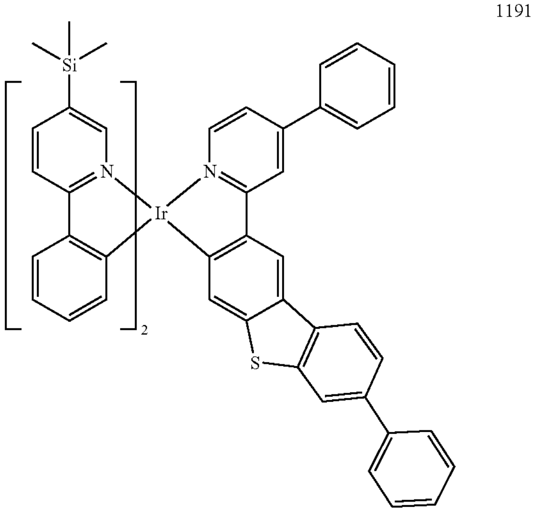
1192
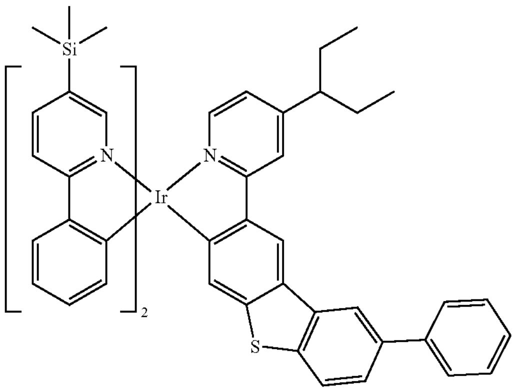
1193
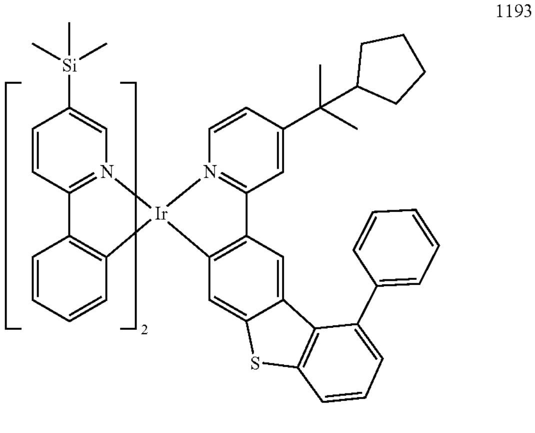
-continued
1194
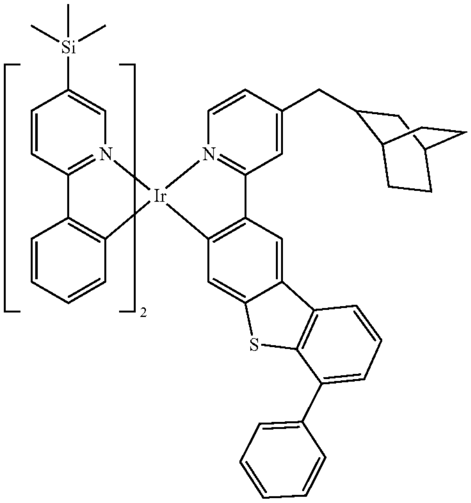
1195
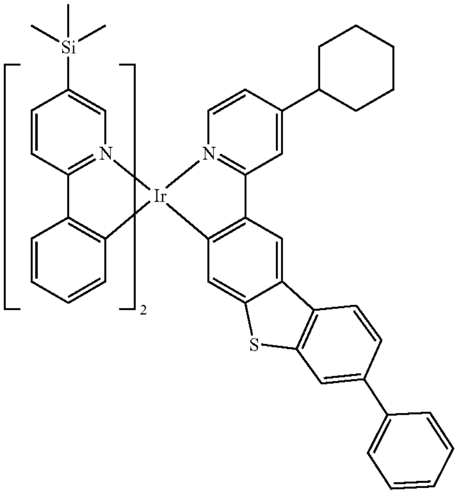
1196
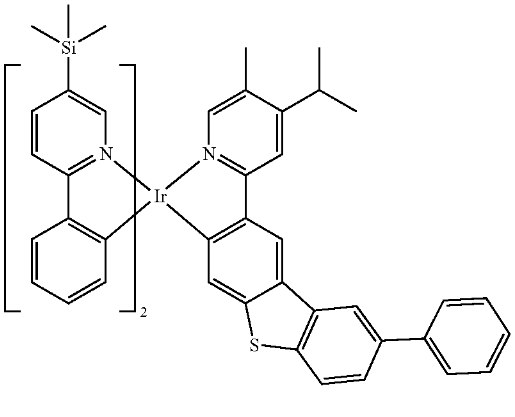

1197
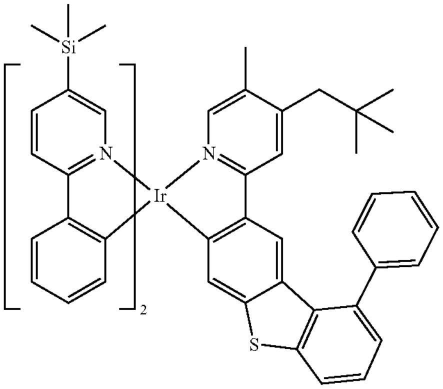
1198
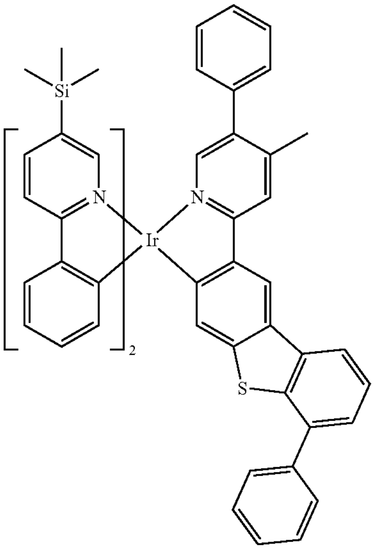
1199
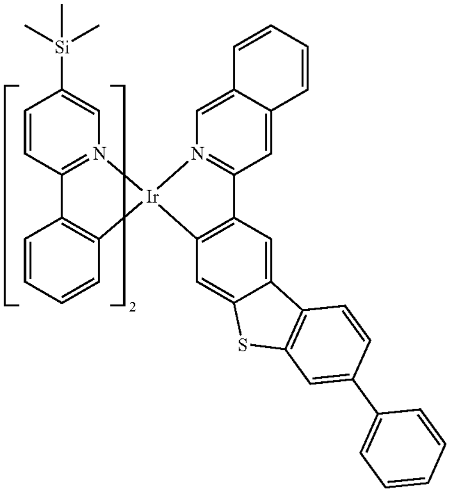
1200
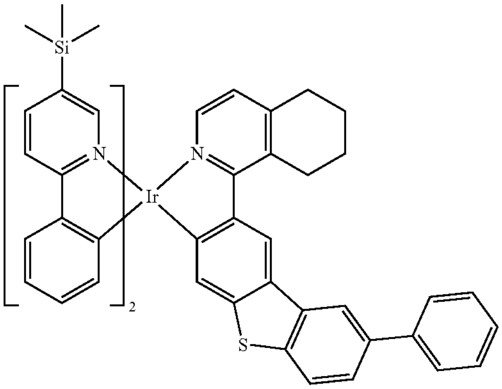
1201
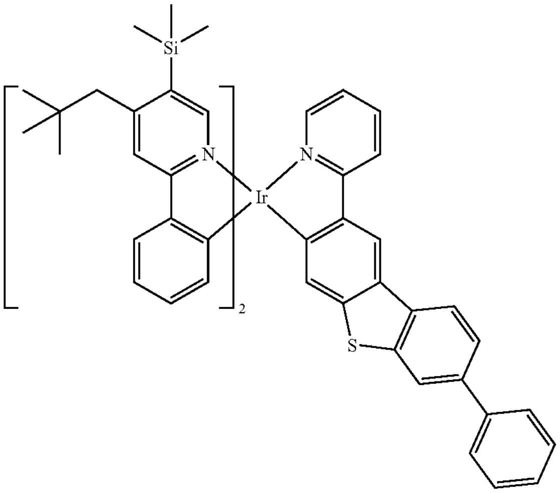
1202
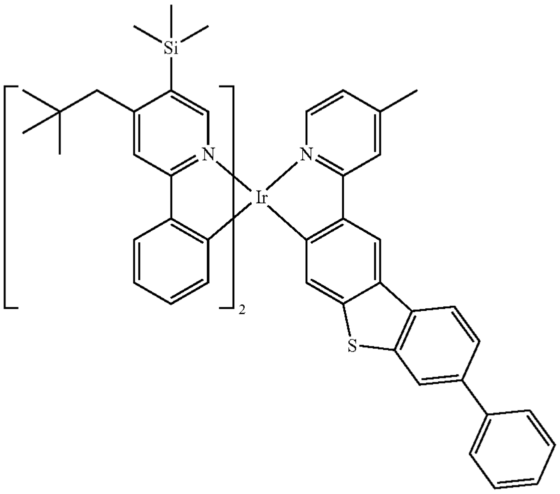

-continued
1203
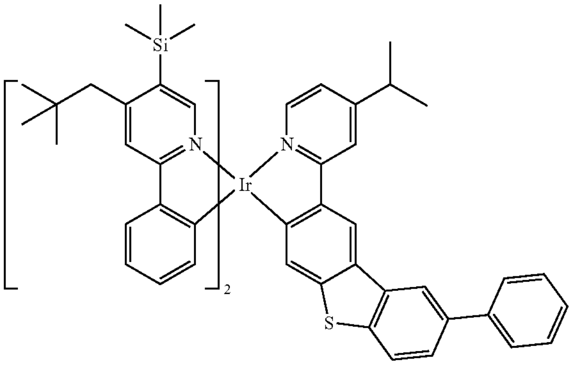
1204
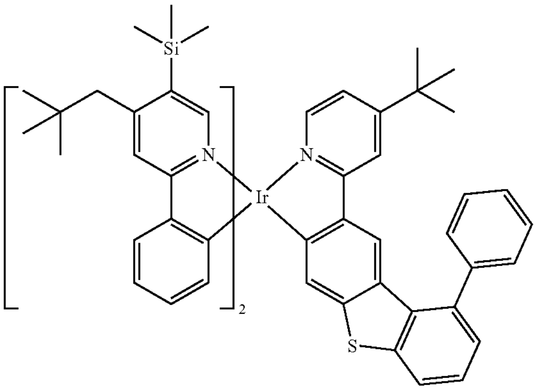
1205
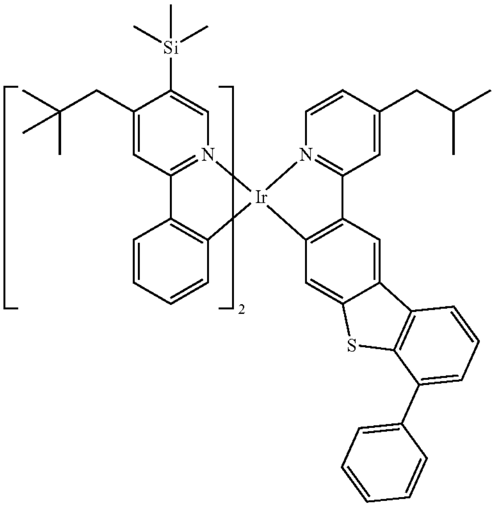
-continued
1206
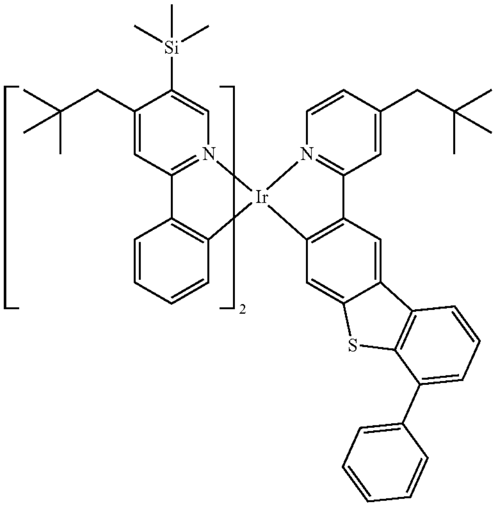
1207
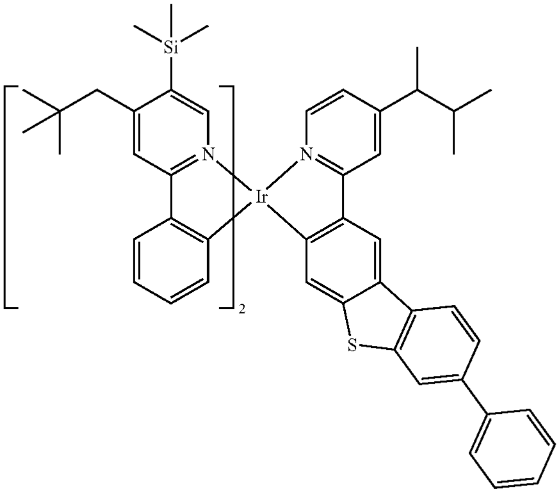
1208
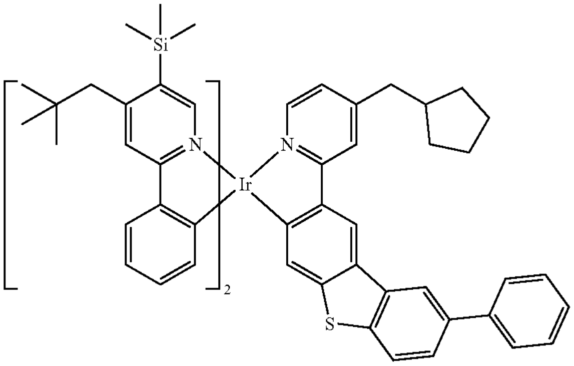

1209
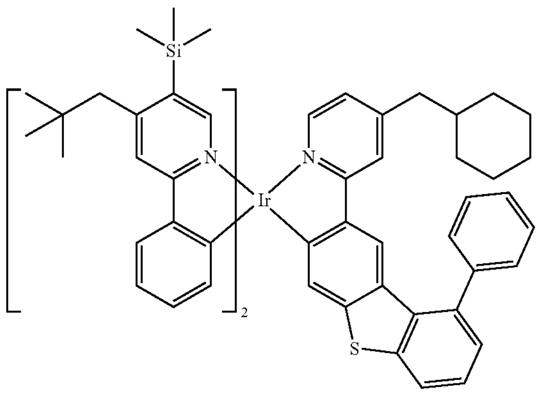
1210
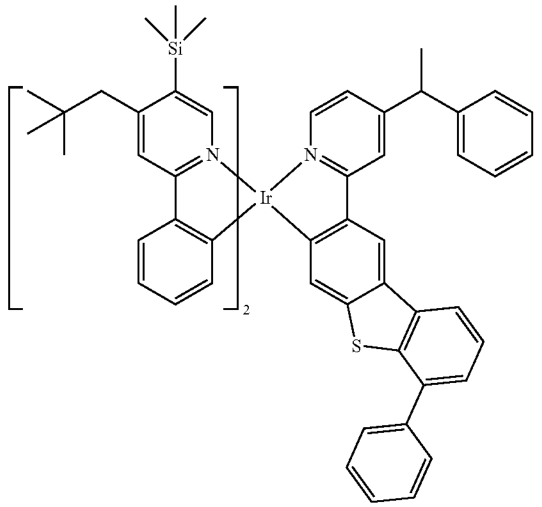
1211
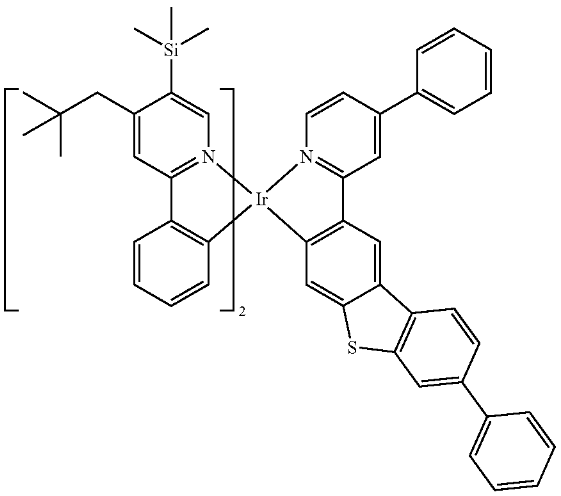
1212
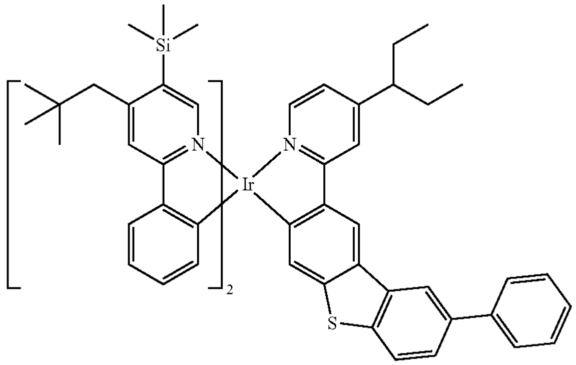
1213
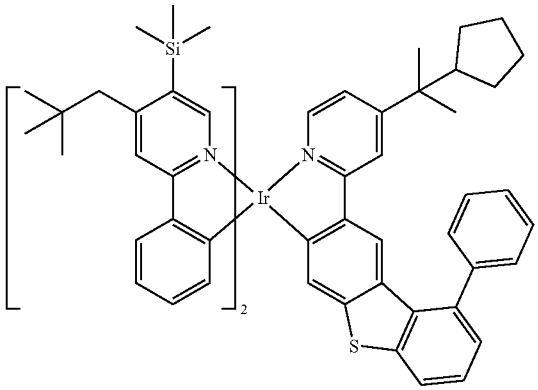
1214
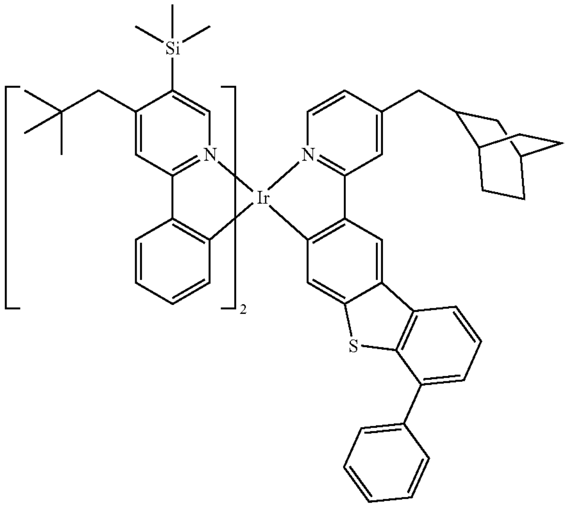

-continued
1215
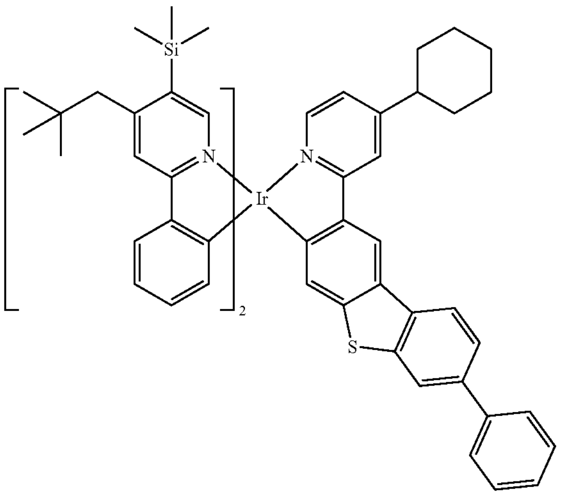
1216
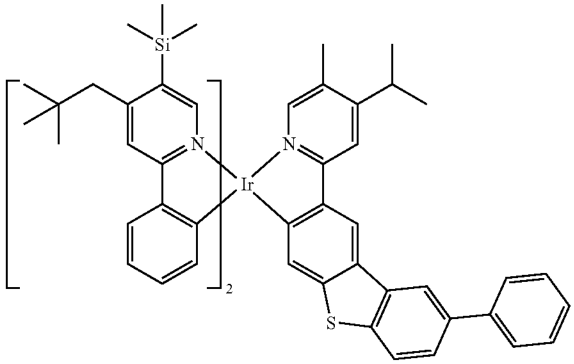
1217
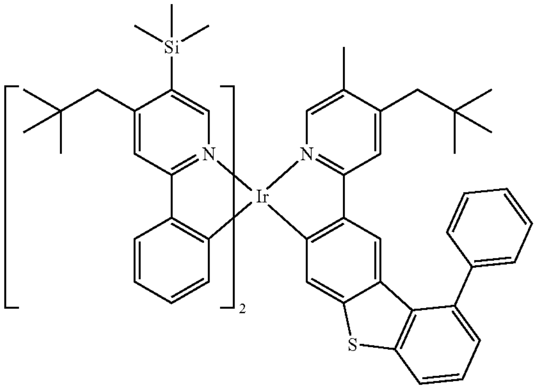
-continued
1218
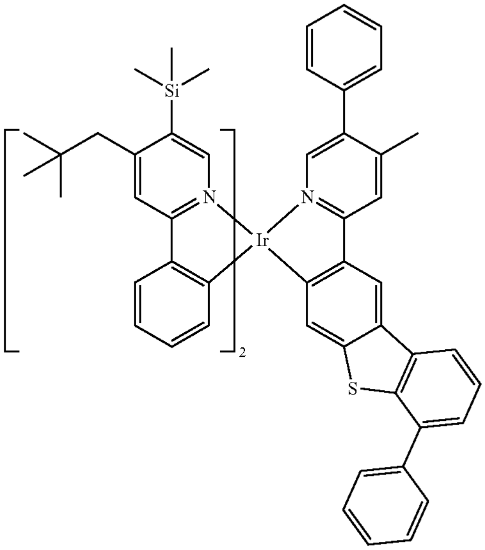
1219
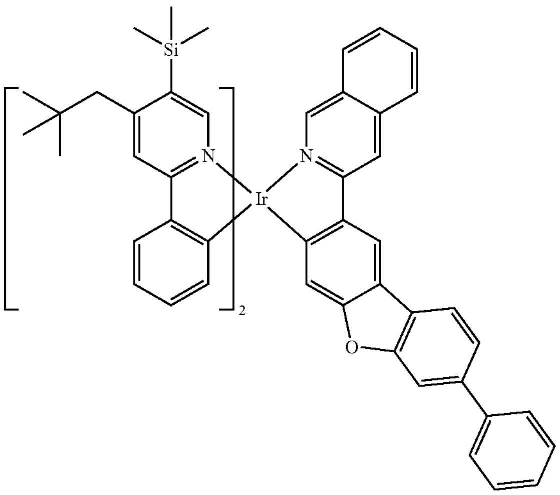
1220
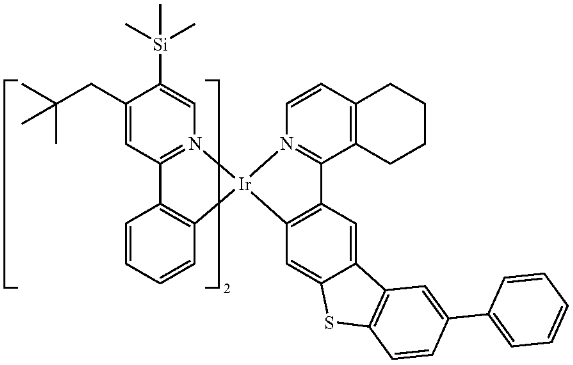

-continued
1221
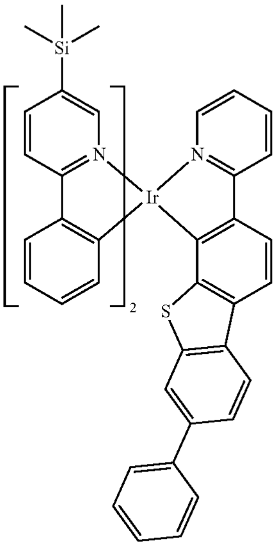
1222
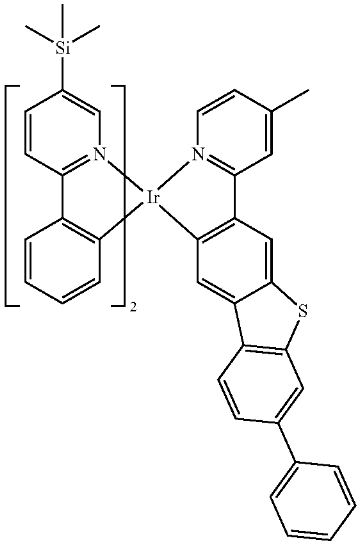
1223
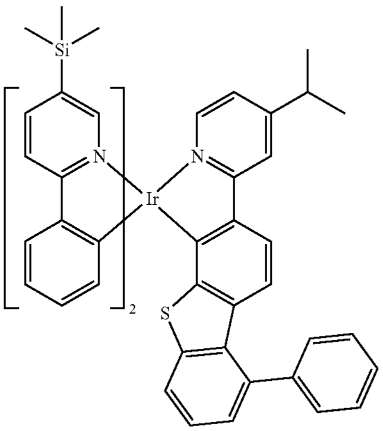
1224
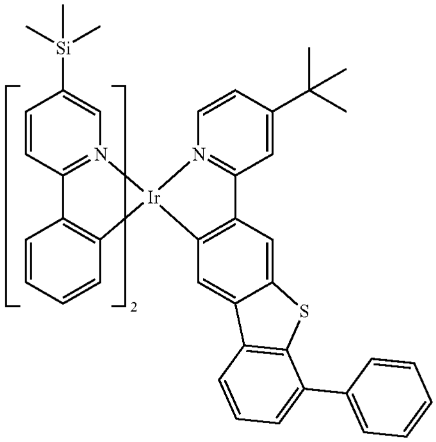
1225
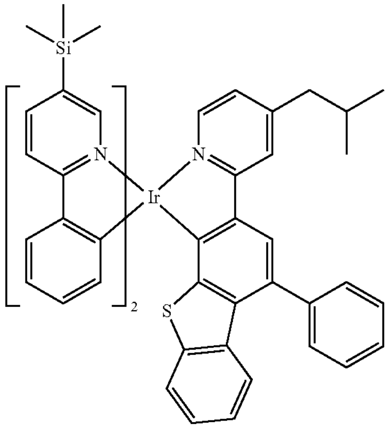
1226
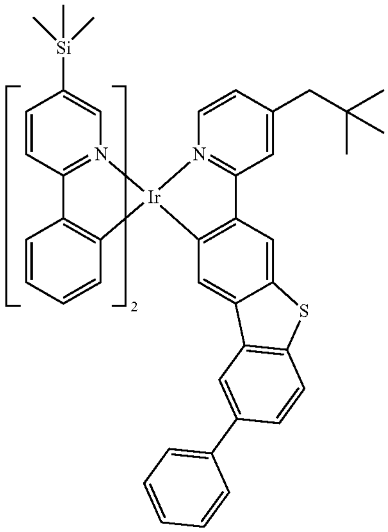

-continued
1227
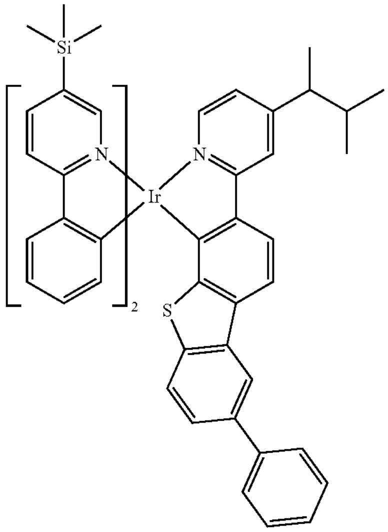
1228
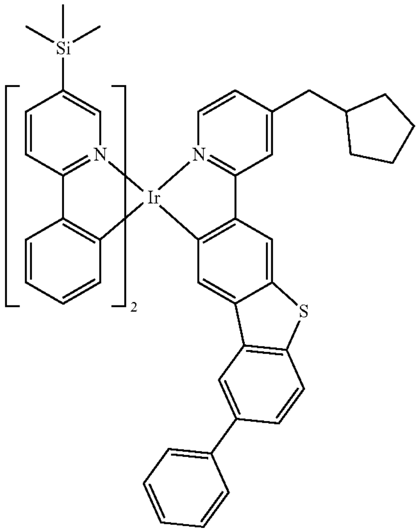
1229
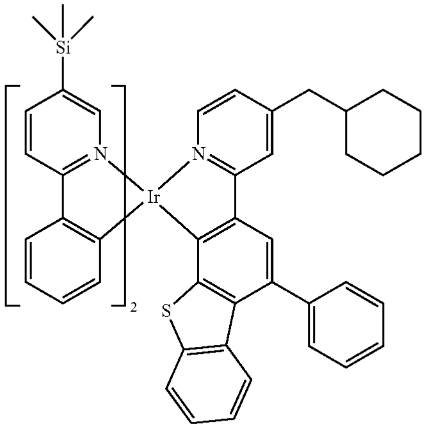
-continued
1230
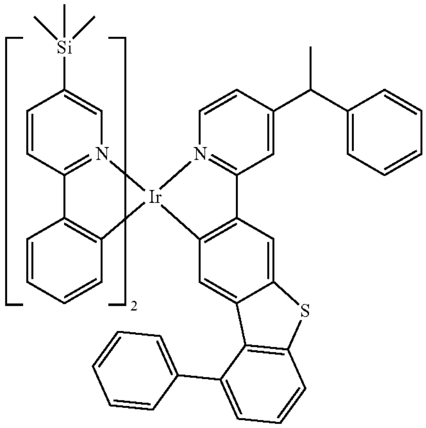
1231
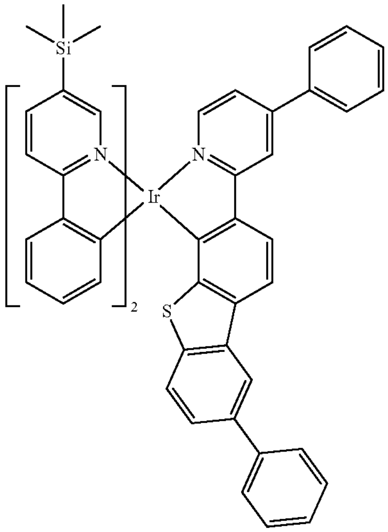
1232
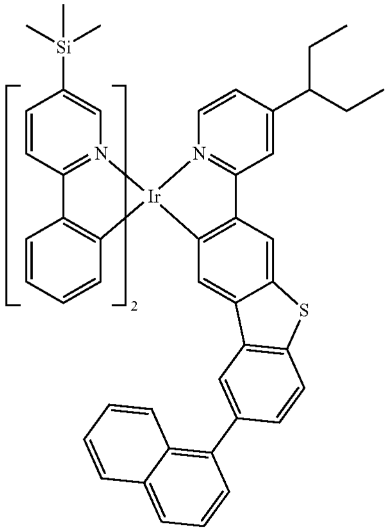

-continued
1233
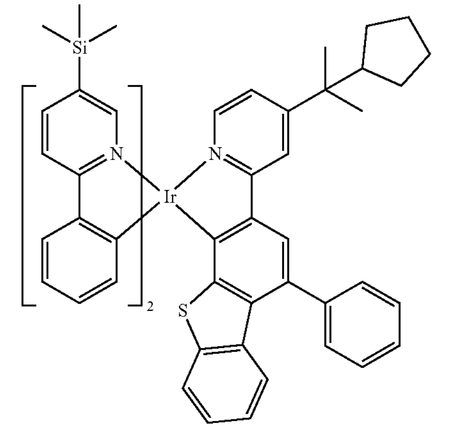
1234
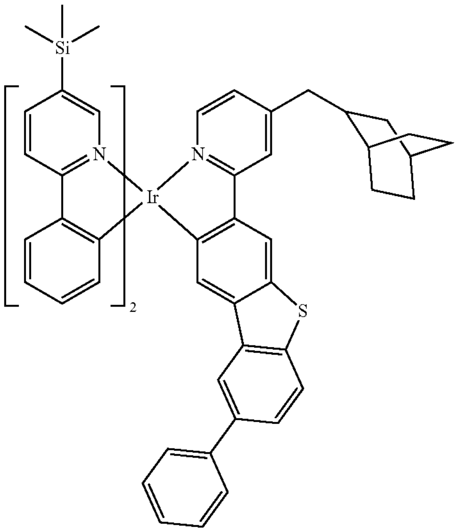
1235
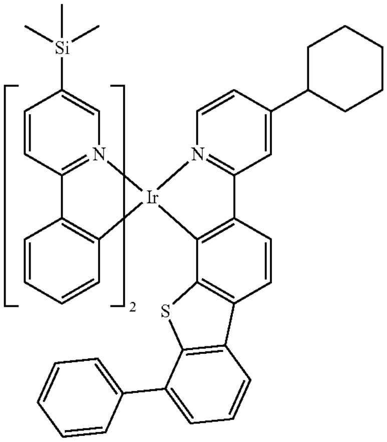
-continued
1236
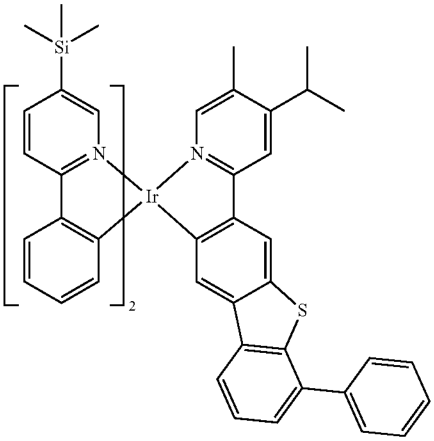
1237
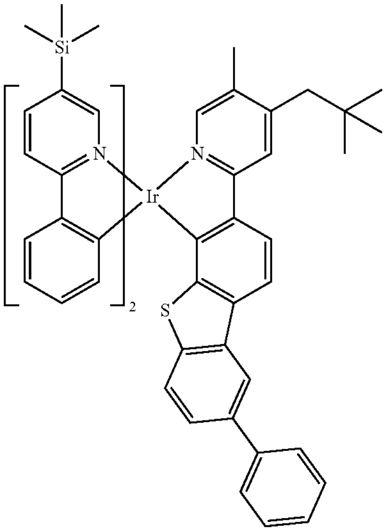
1238
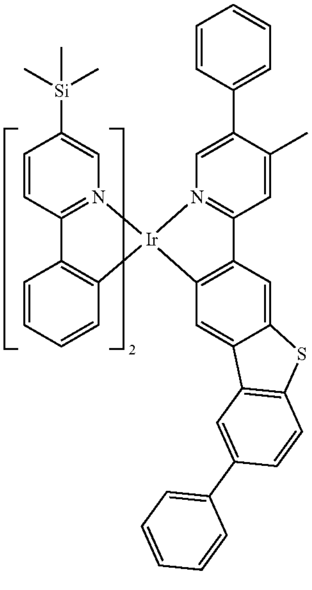

-continued
1239
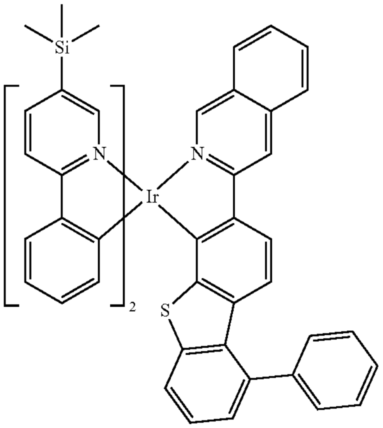
1240
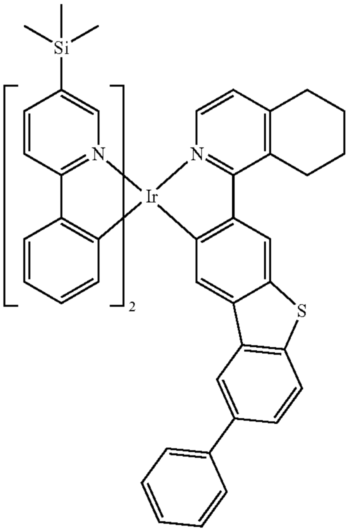
1241
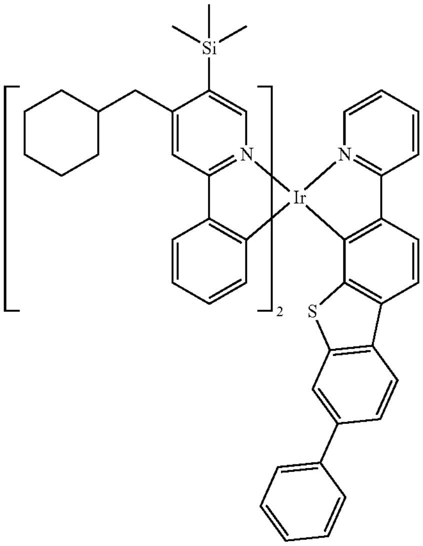
-continued
1242
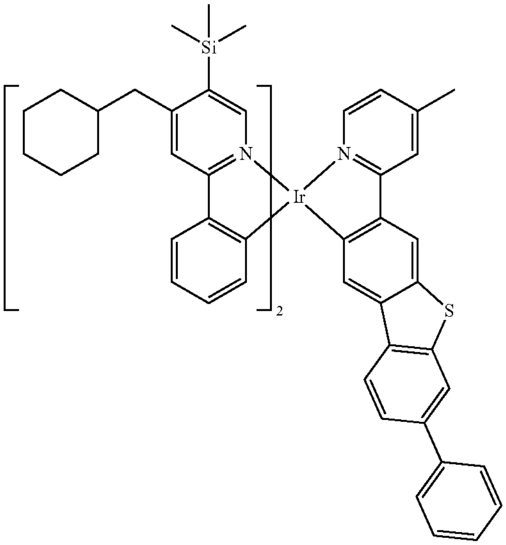
1243
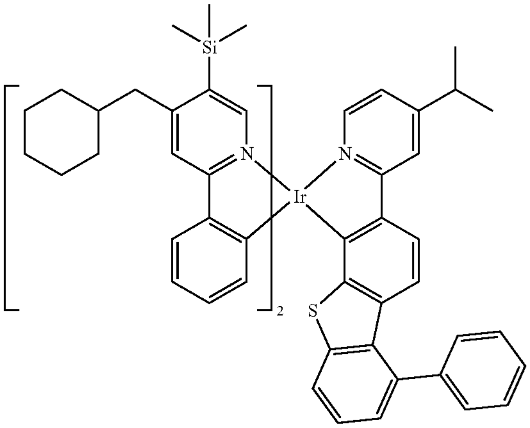
1244
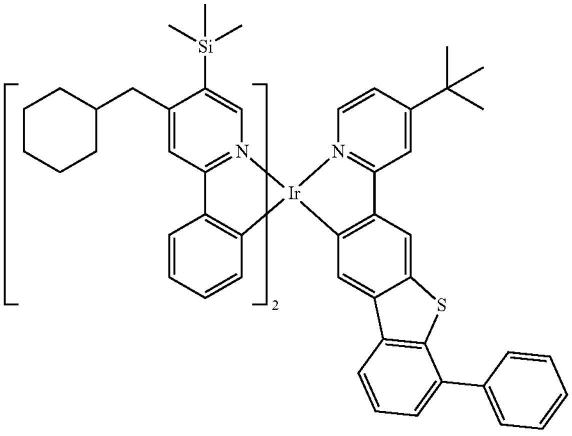

-continued
1245
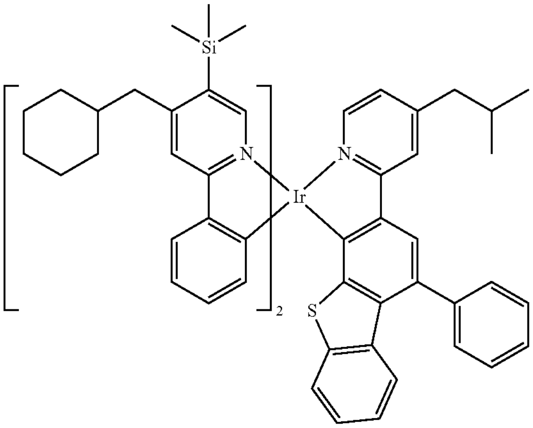
1246
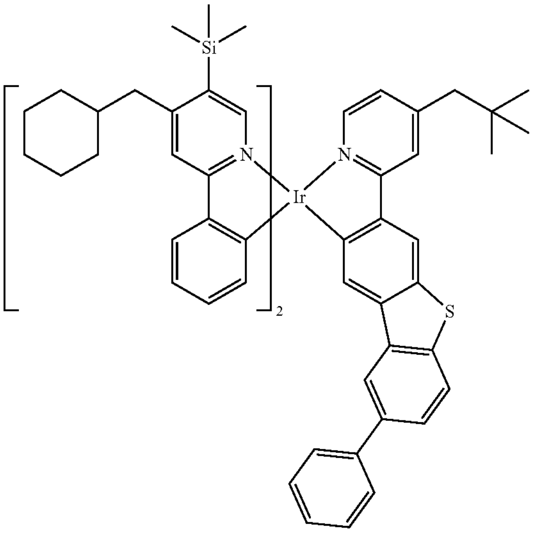
1247
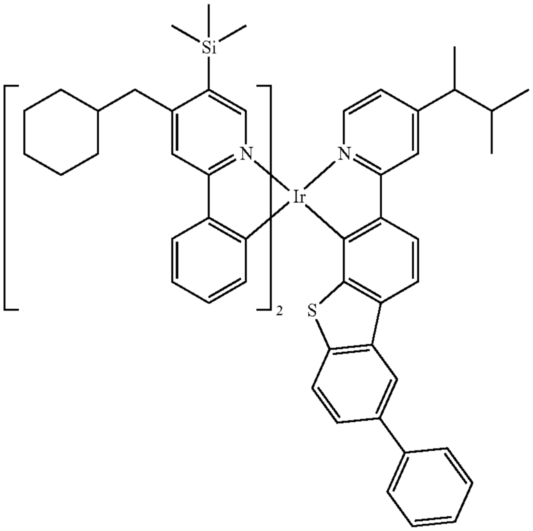
-continued
1248
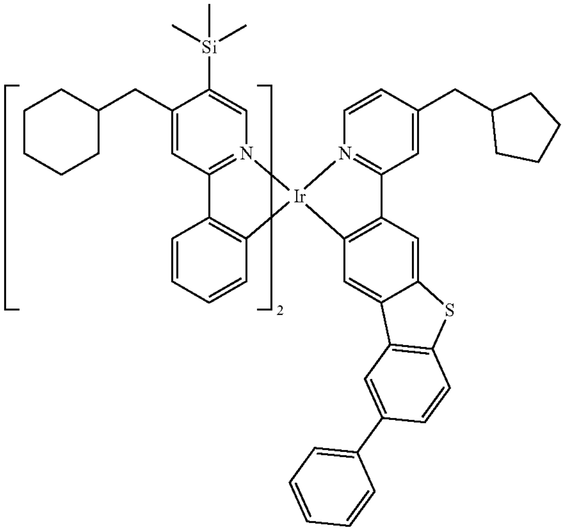
1249
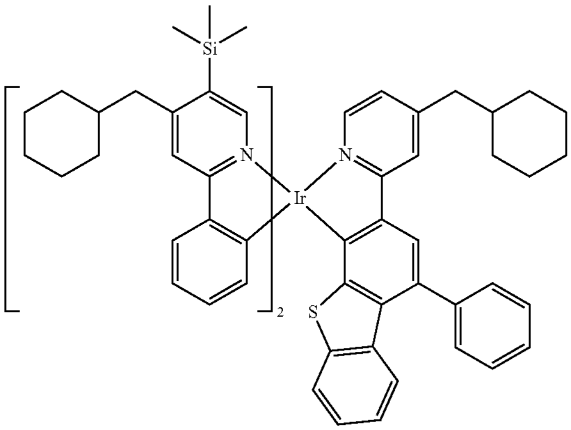
1250
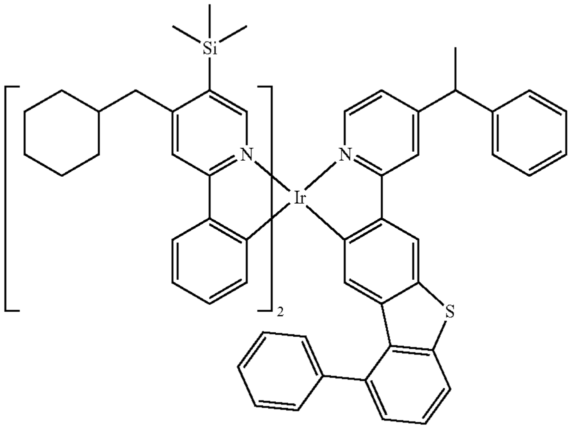

-continued
1251
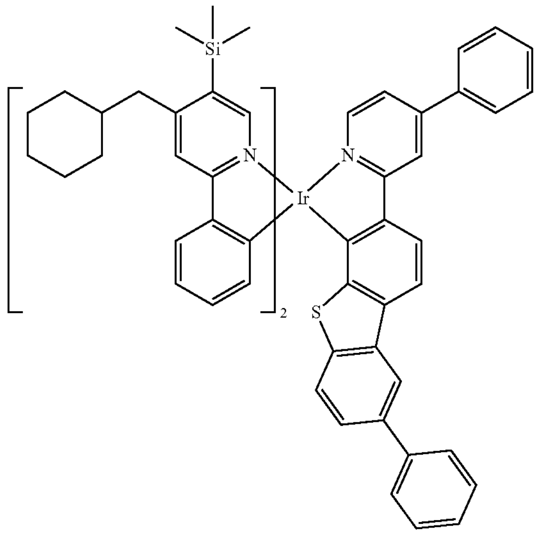
1252
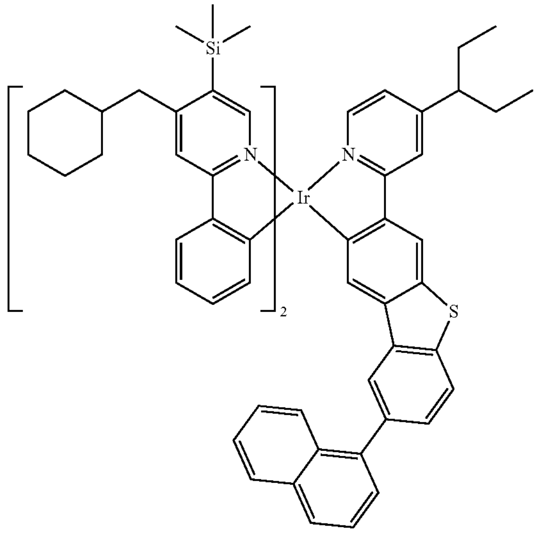
1253
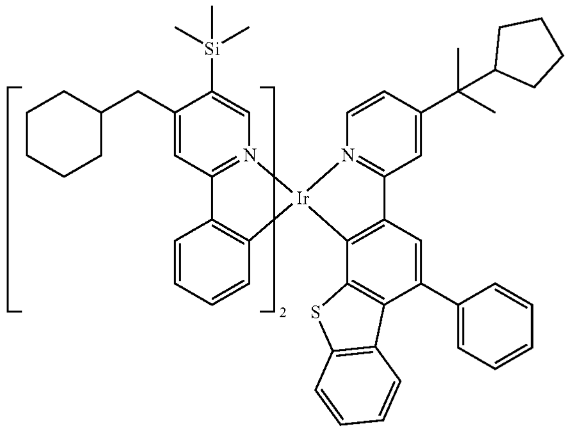
-continued
1254
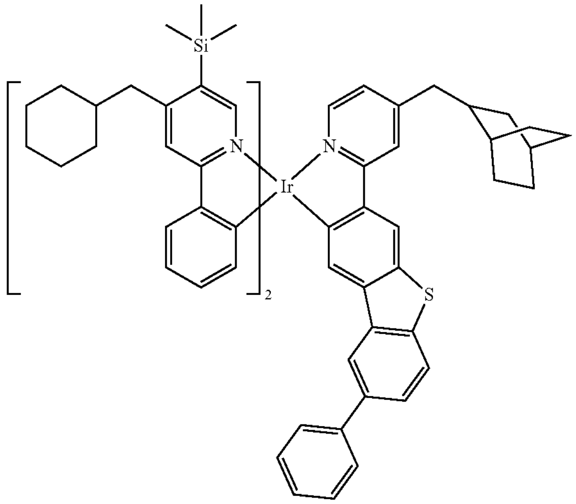
1255
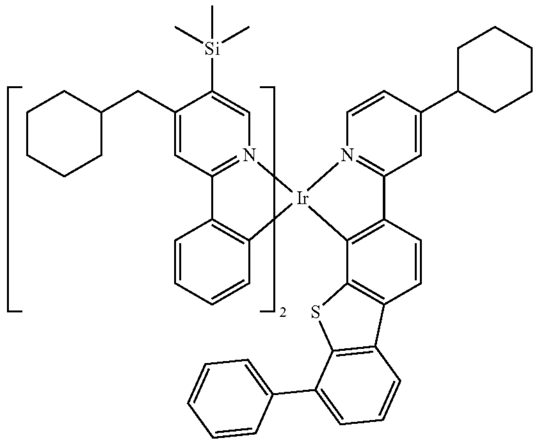
1256
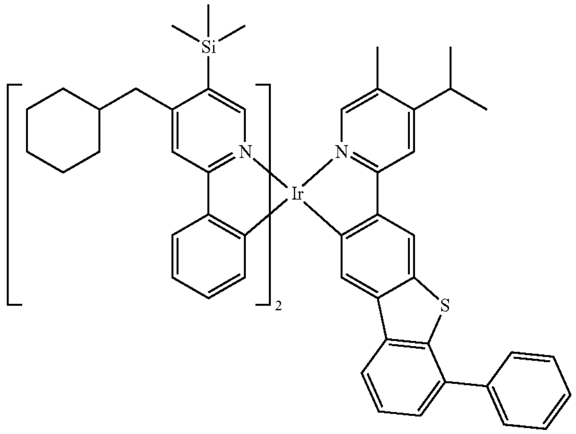

-continued
1257
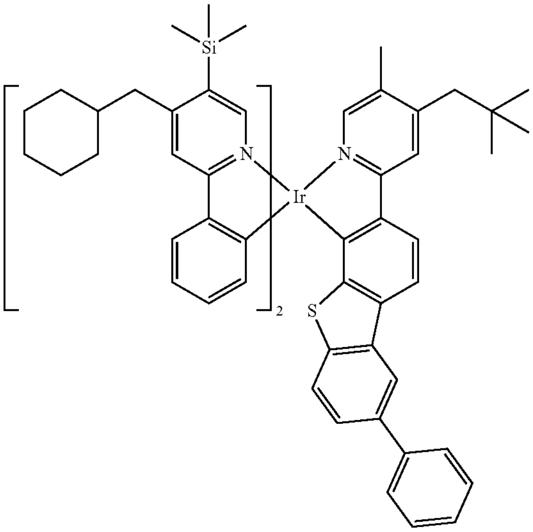
1258
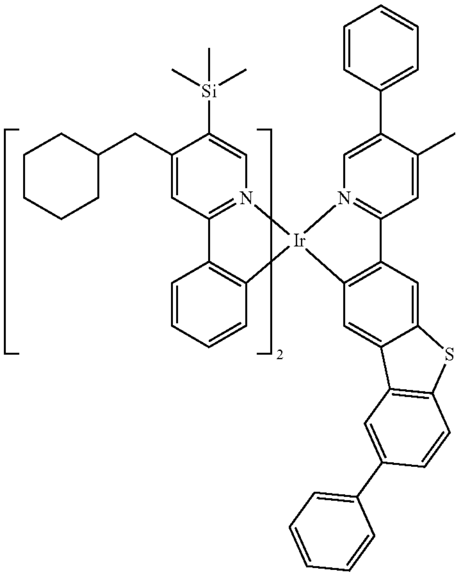
1259
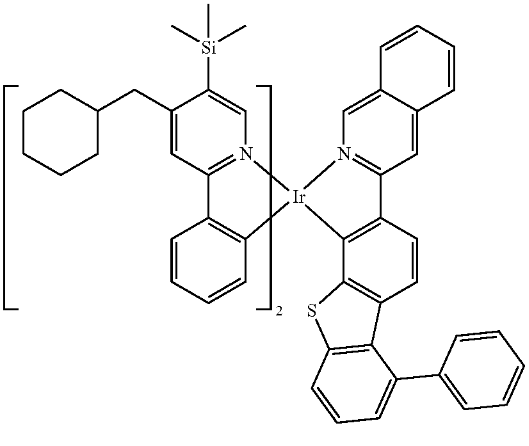
-continued
1260
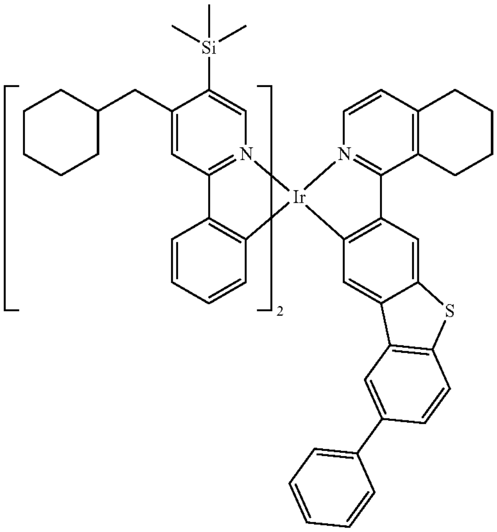
1261
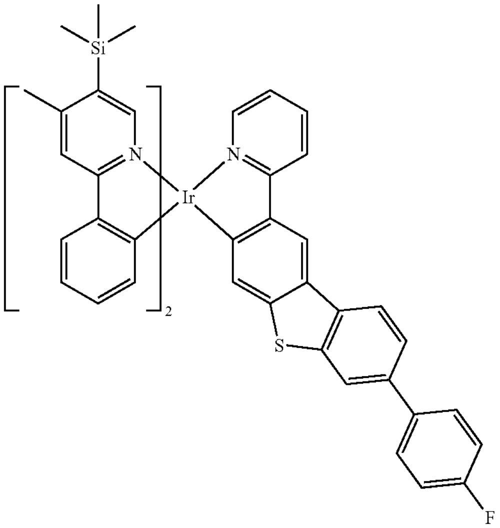
1262
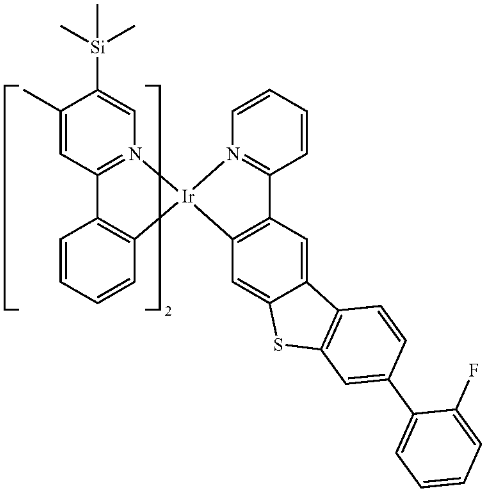

-continued
1263
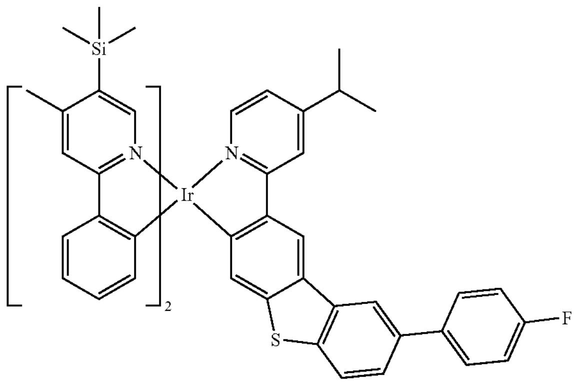
1264
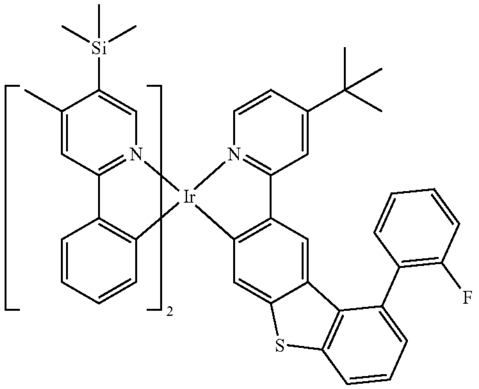
1265
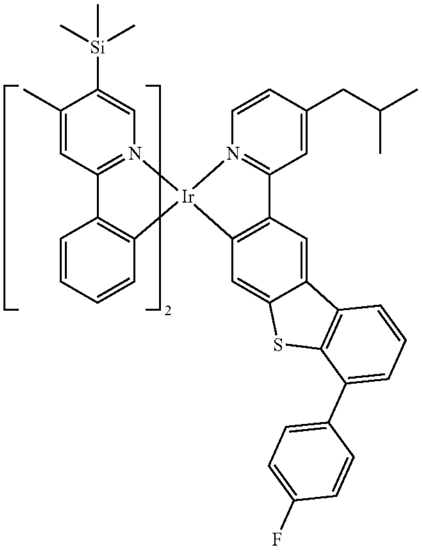
-continued
1266
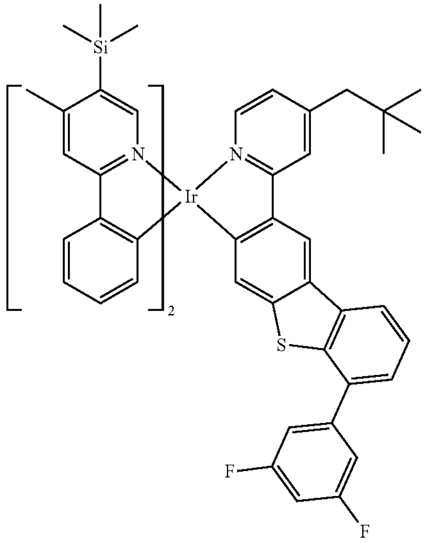
1267
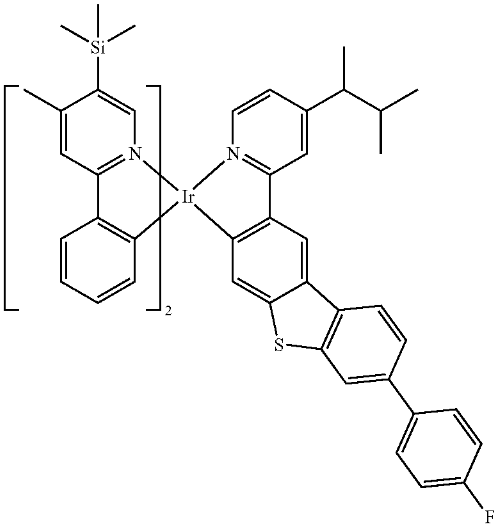
1268
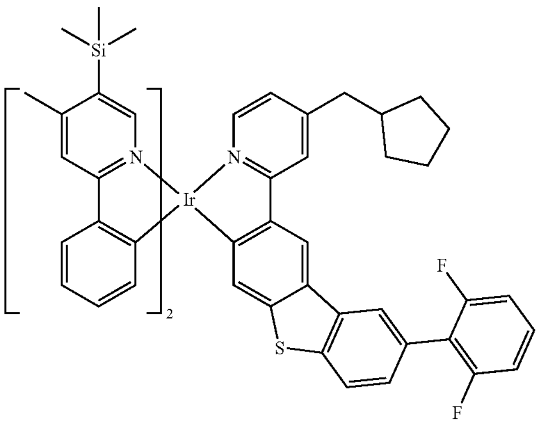

-continued
1269
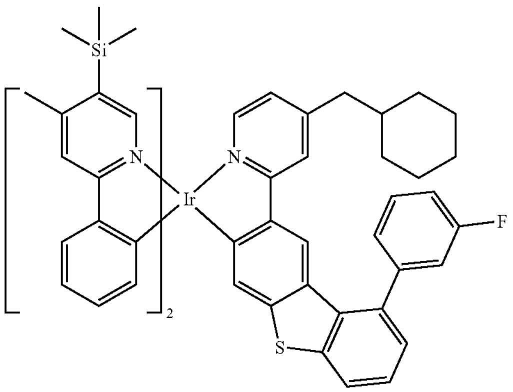
1270
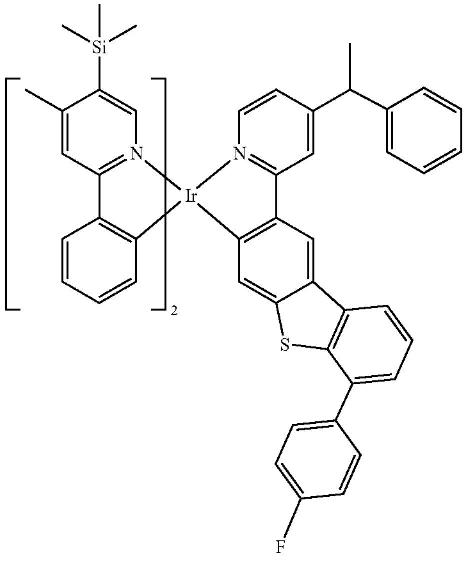
1271
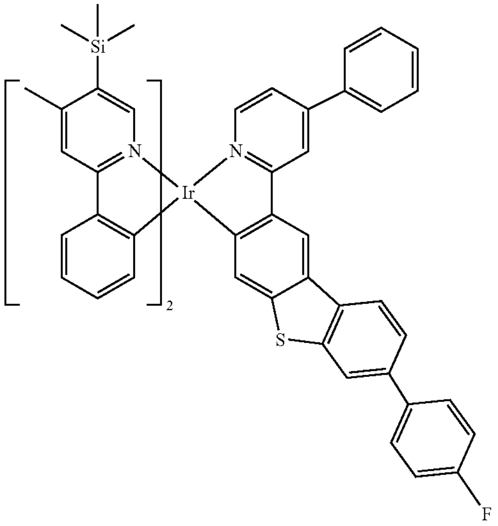
-continued
1272
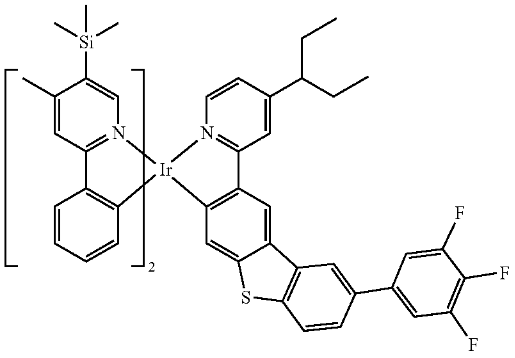
1273
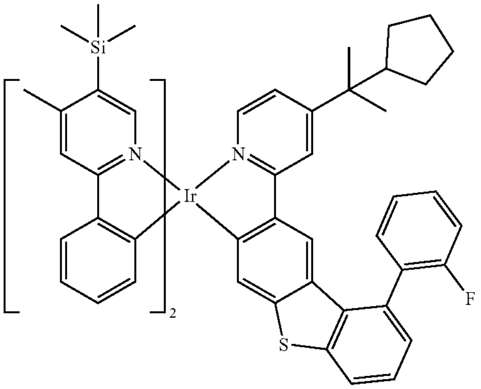
1274
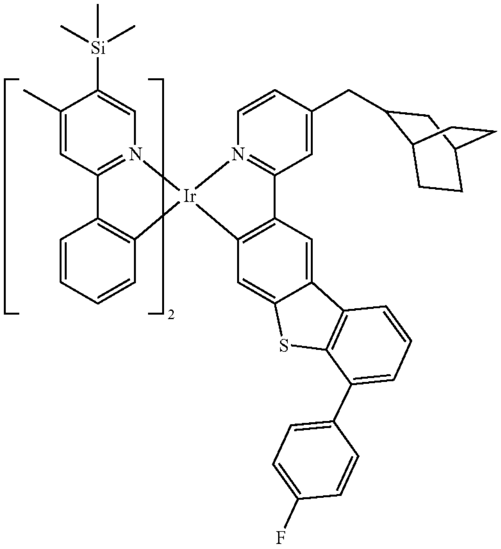

-continued
1275
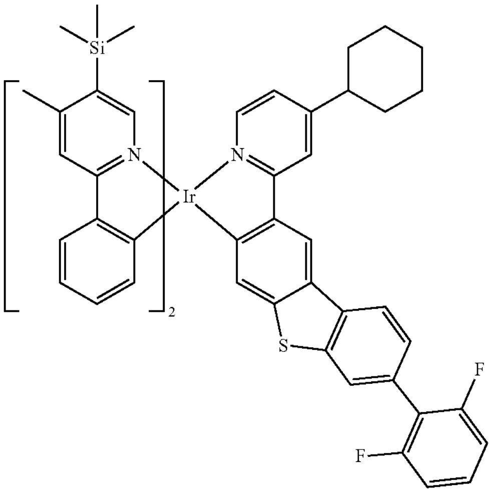
1276
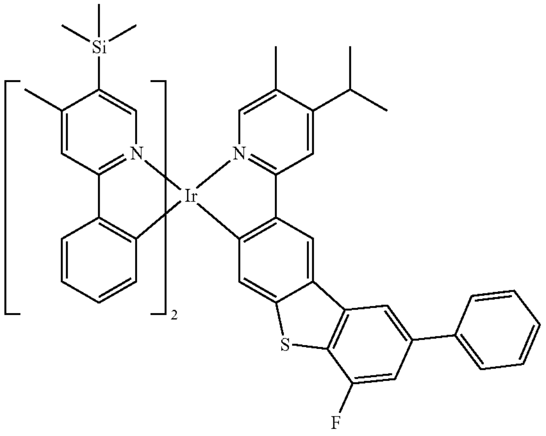
1277
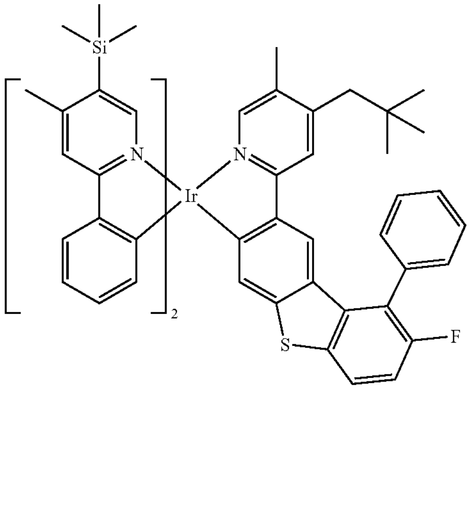
-continued
1278
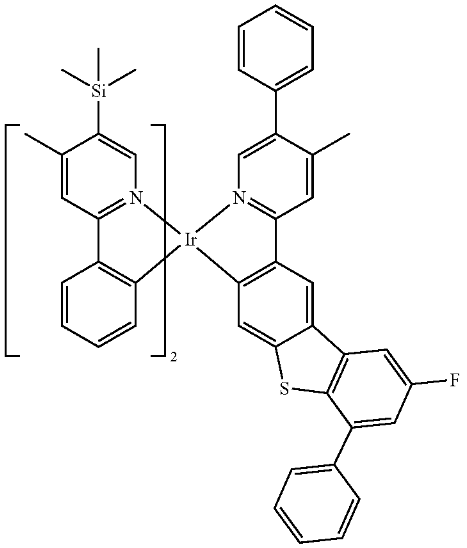
1279
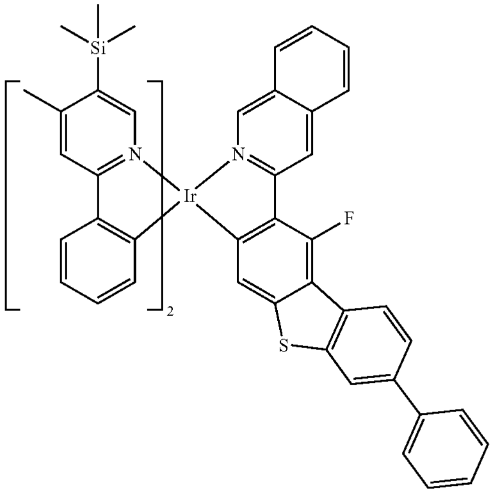
1280
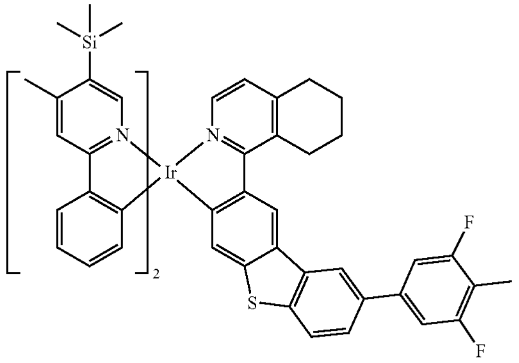

-continued
1281
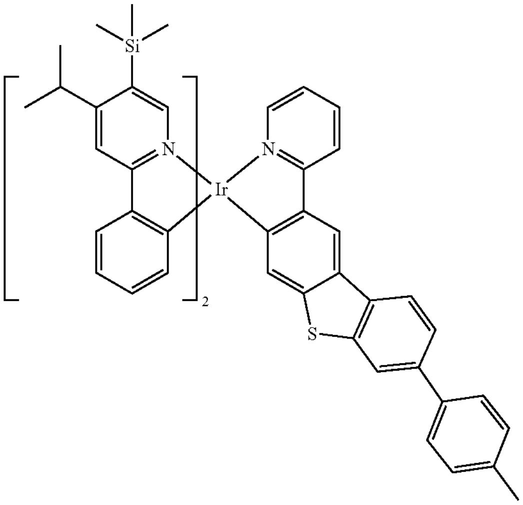
1282
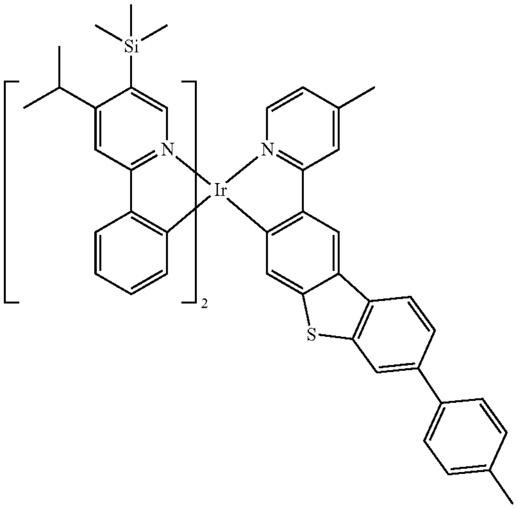
1283
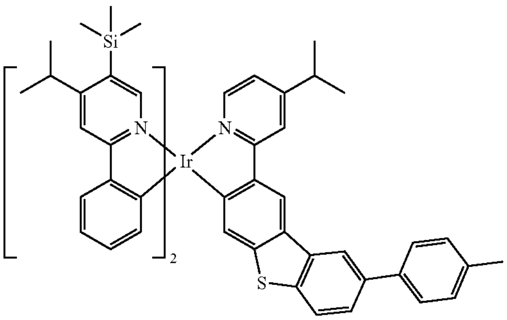
-continued
1284
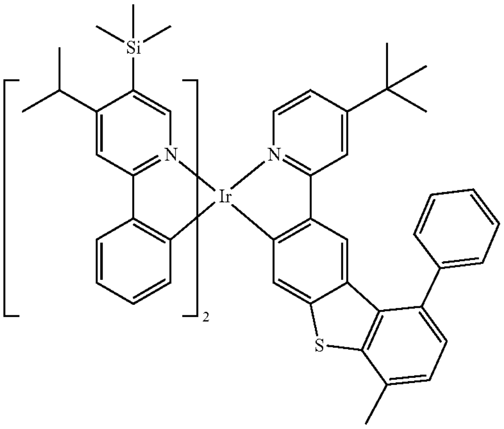
1285
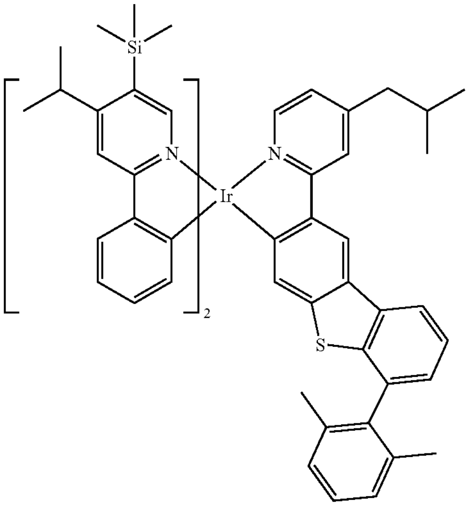
1286
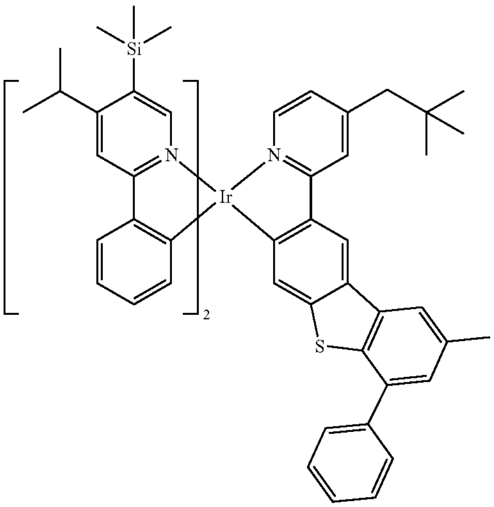

1287
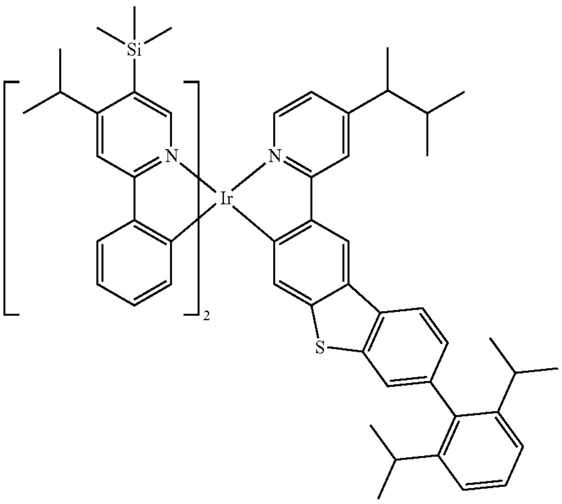
1288
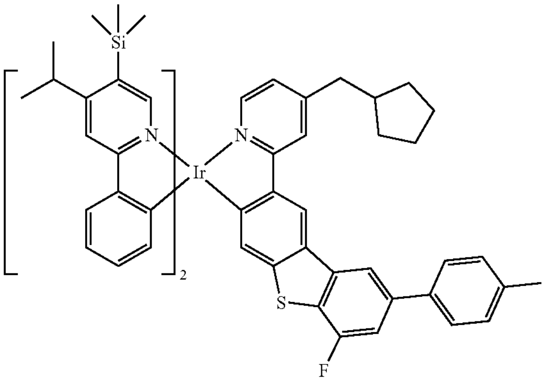
1289
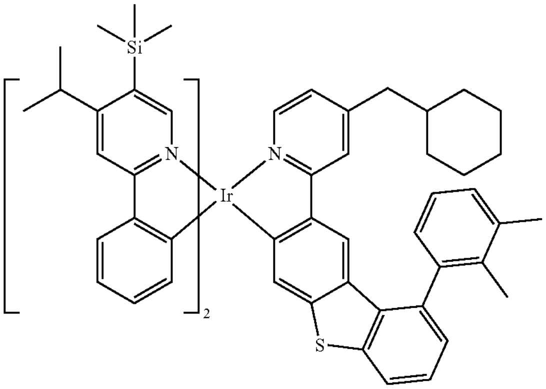
1290
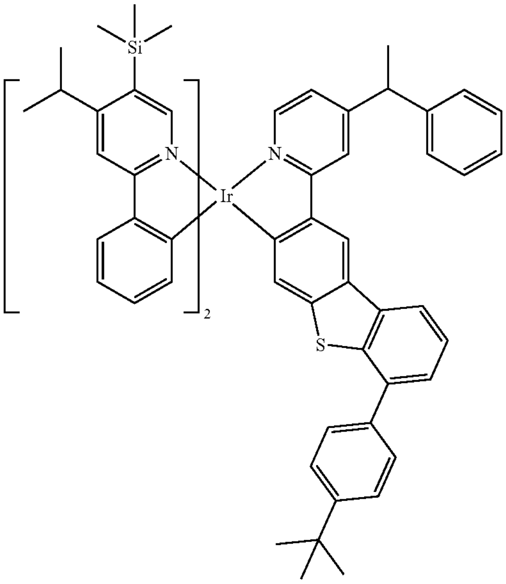
1291
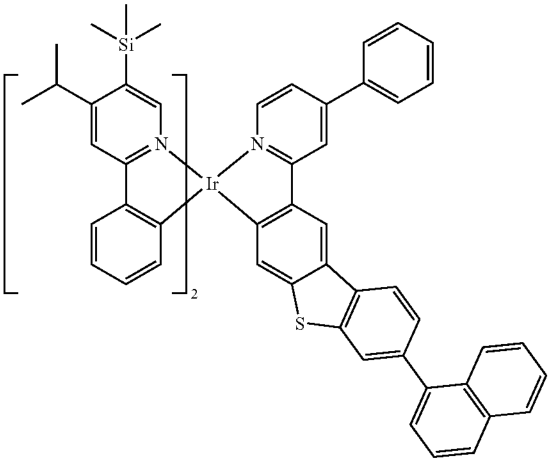
1292
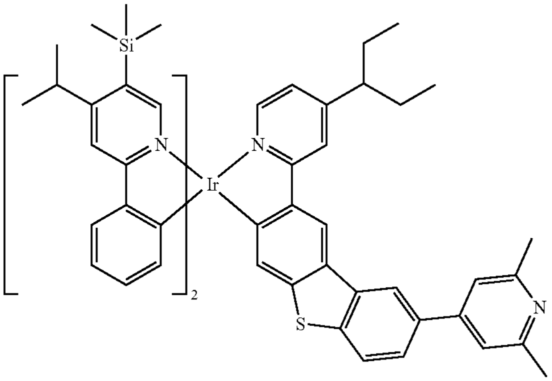

-continued
1293
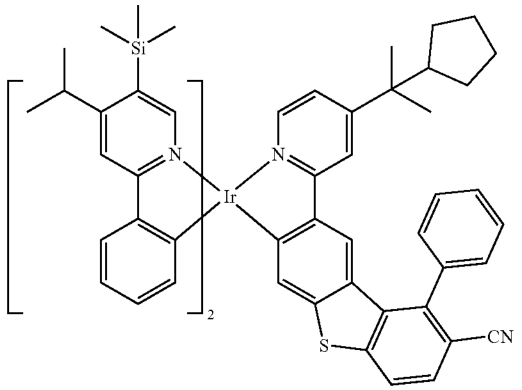
1294
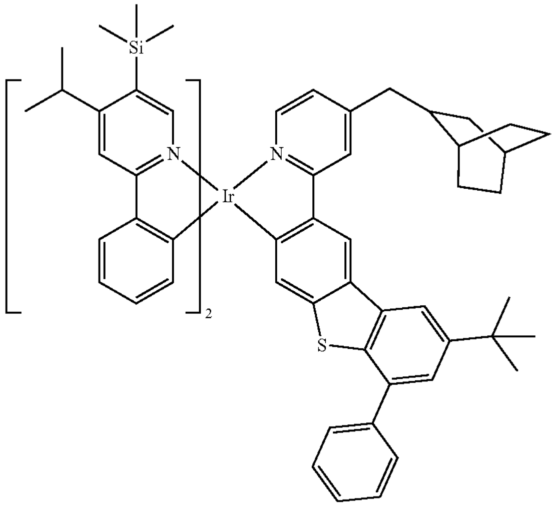
1295
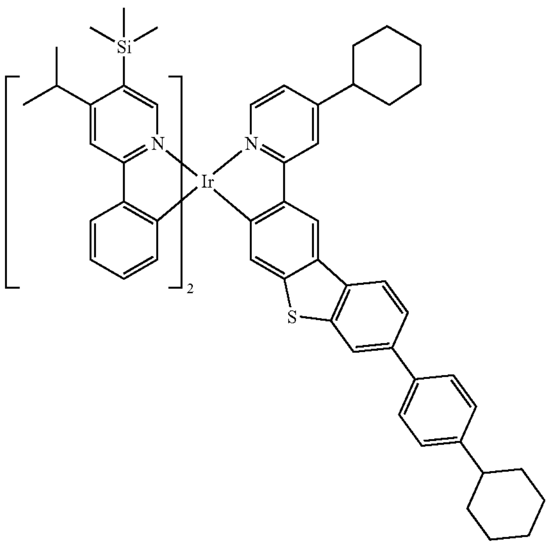
-continued
1296
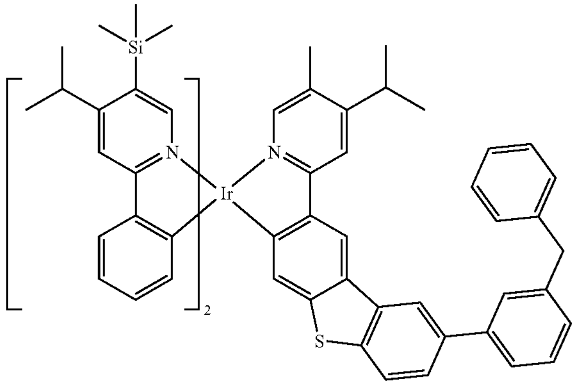
1297
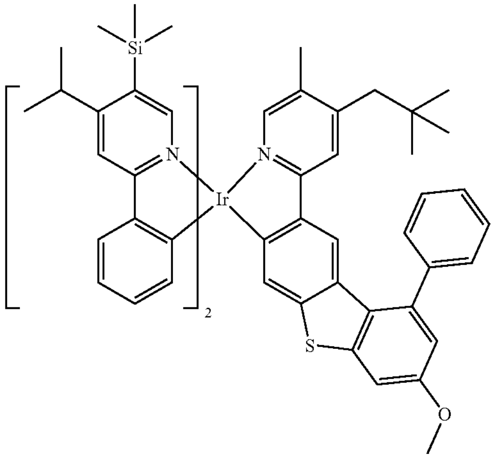
1298
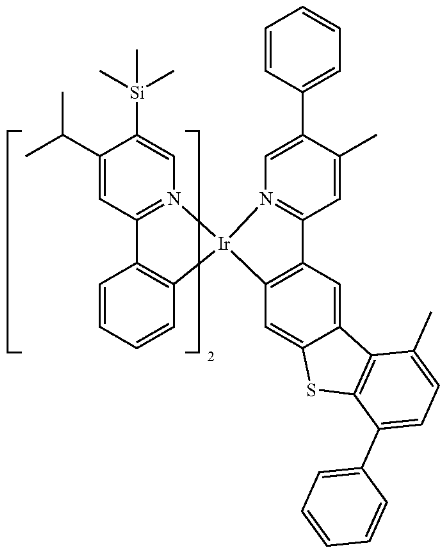

-continued
1299
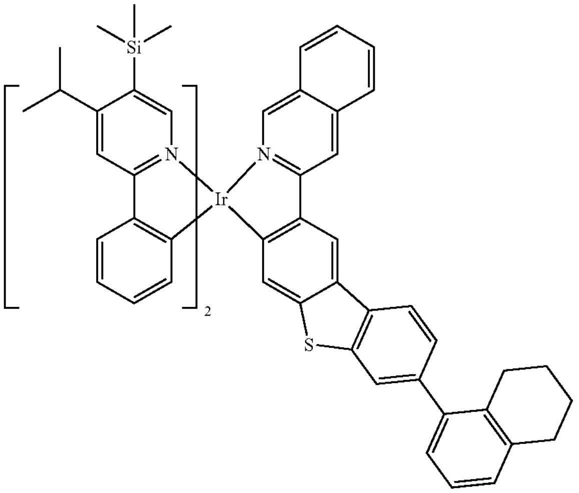
1300
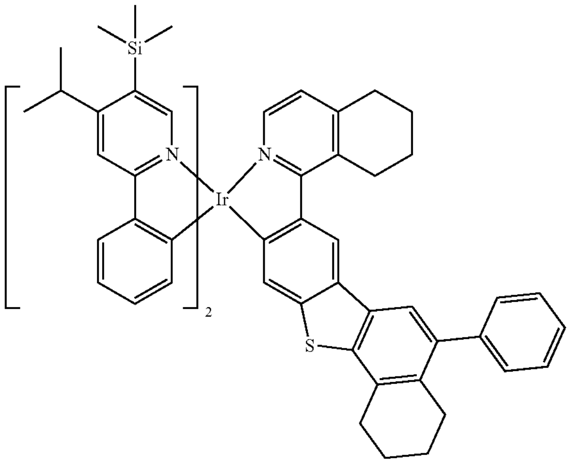
1301
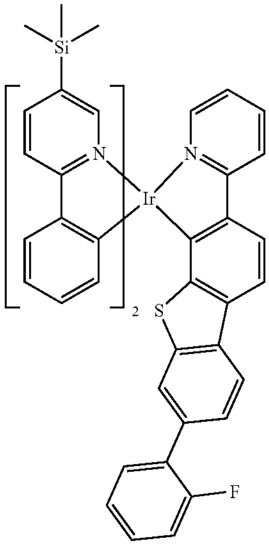
-continued
1302
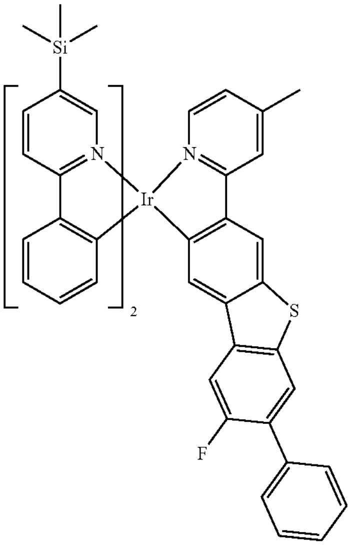
1303
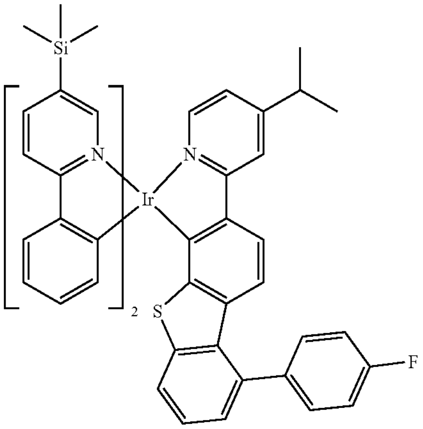
1304
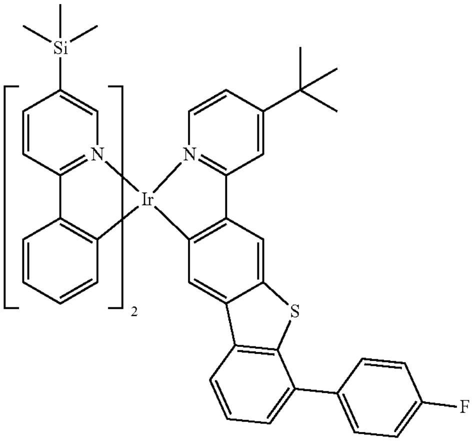

-continued
1305
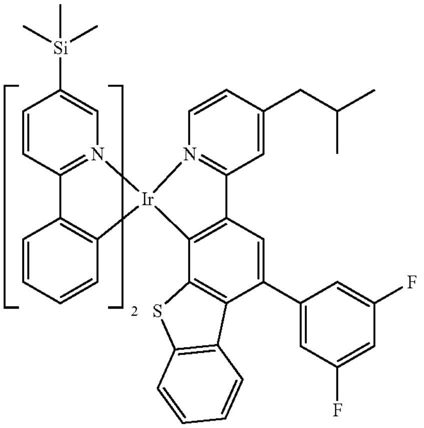
1306
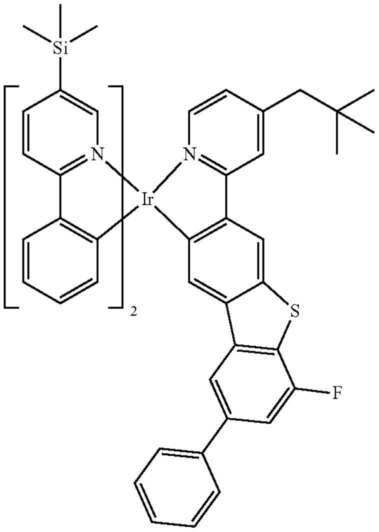
1307
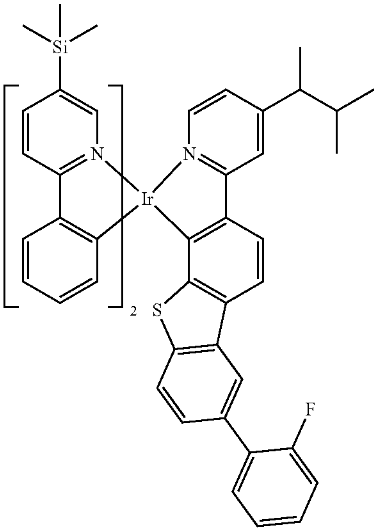
-continued
1308
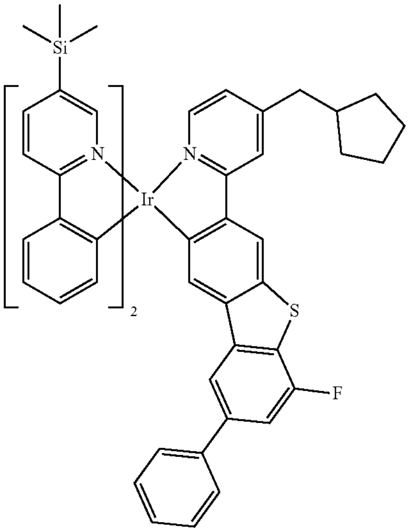
1309
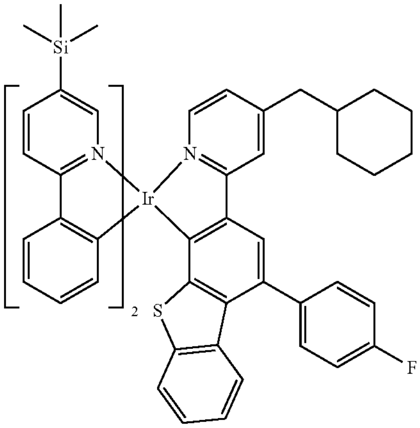
1310
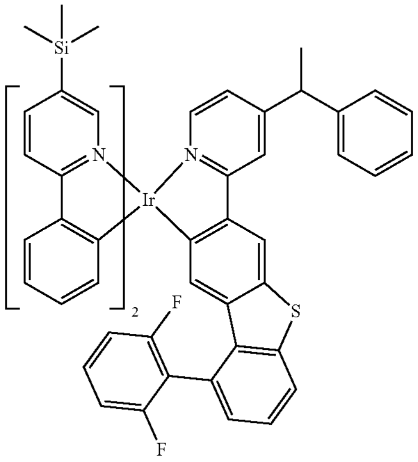

-continued
1311
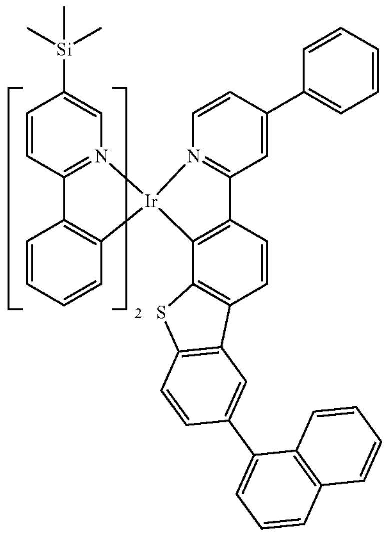
1312
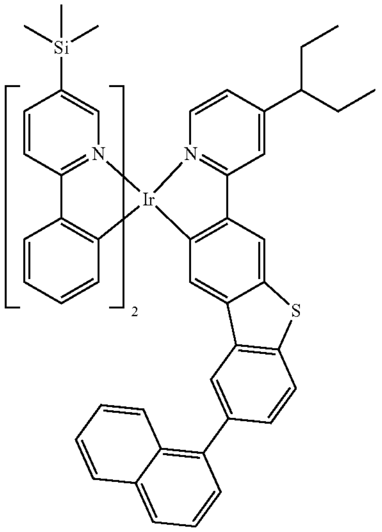
1313
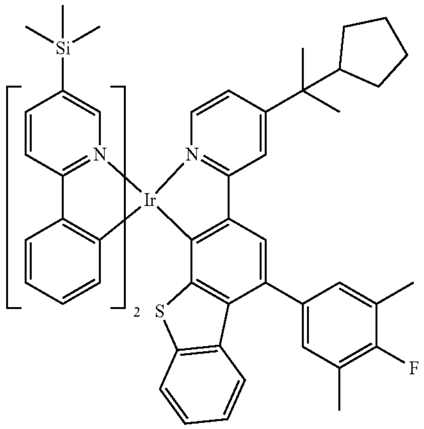
-continued
1314
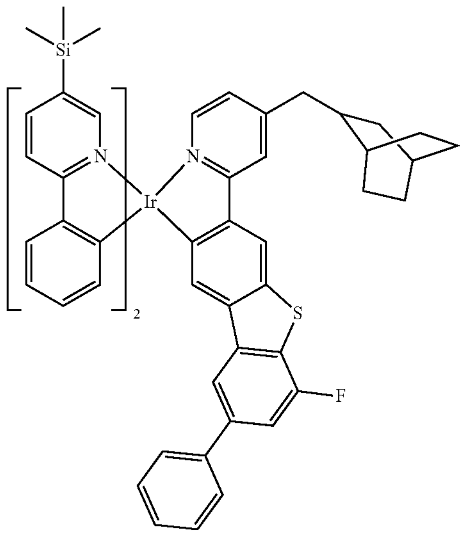
1315
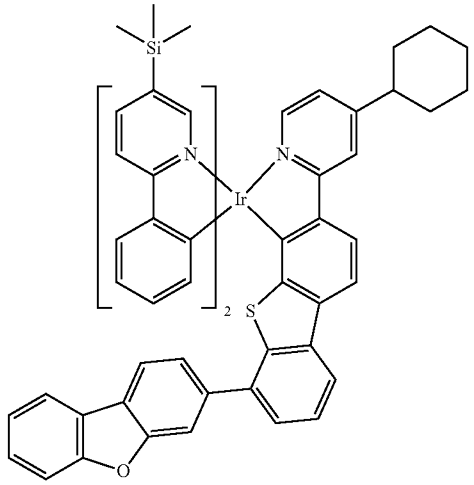
1316
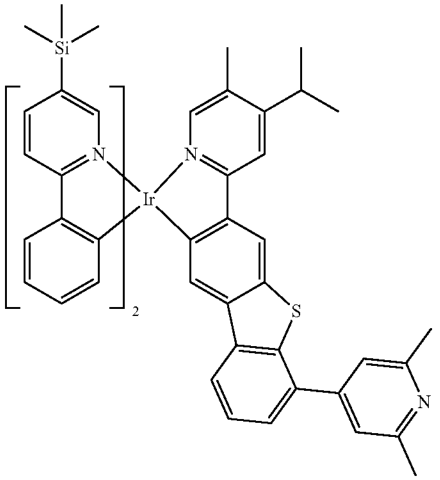

-continued
1317
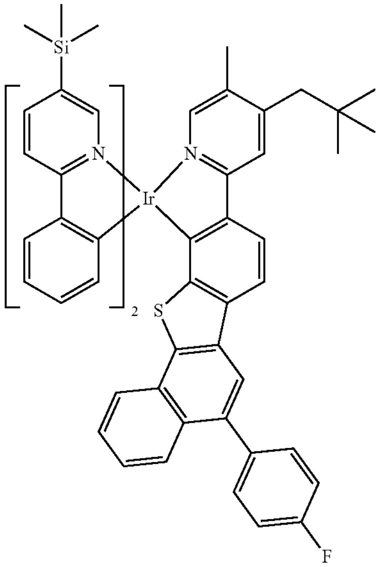
1318
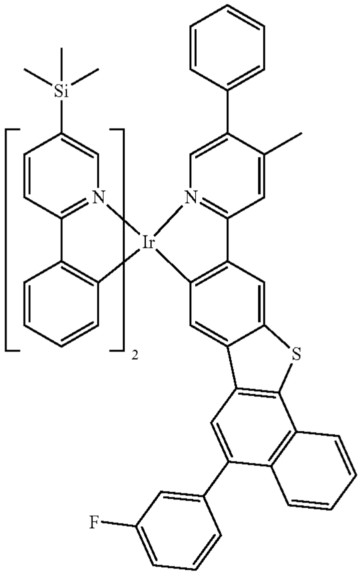
1319
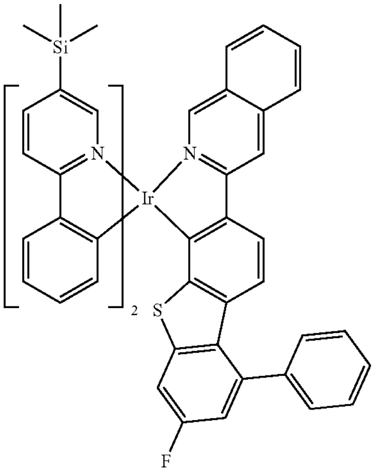
-continued
1320
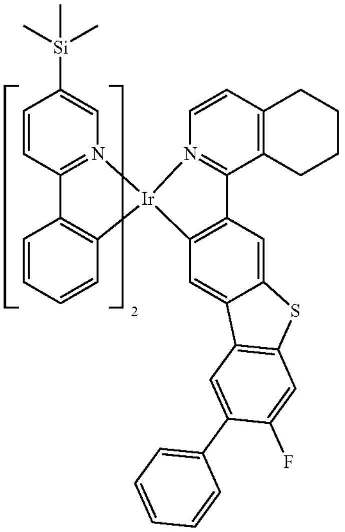
1321
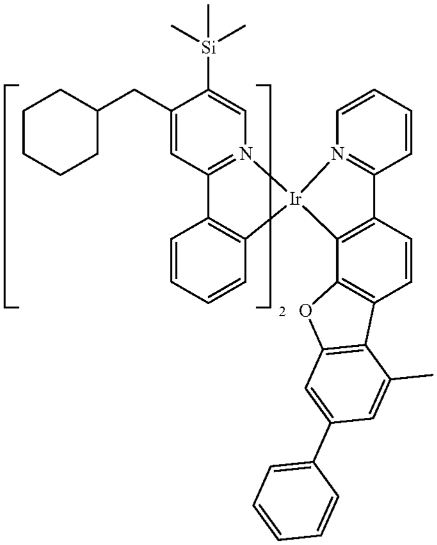
1322
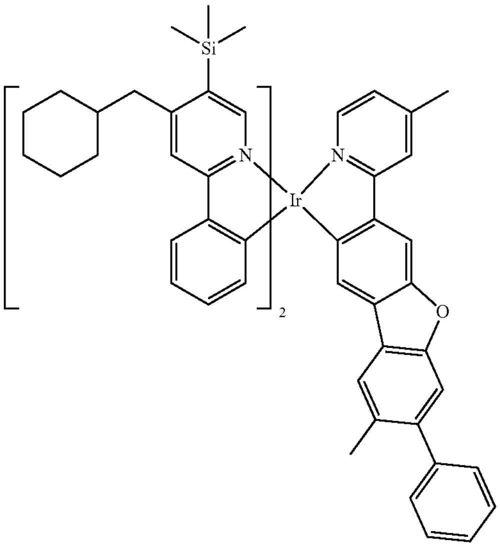

-continued
1323
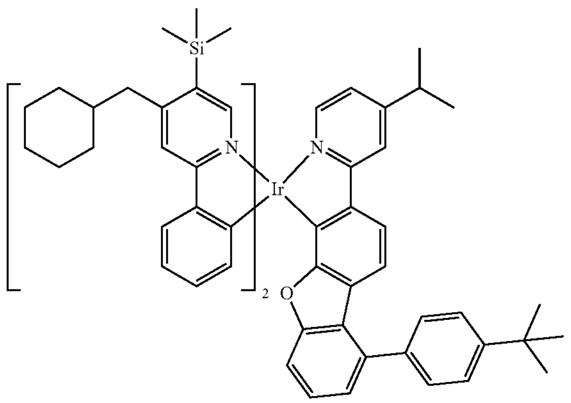
1324
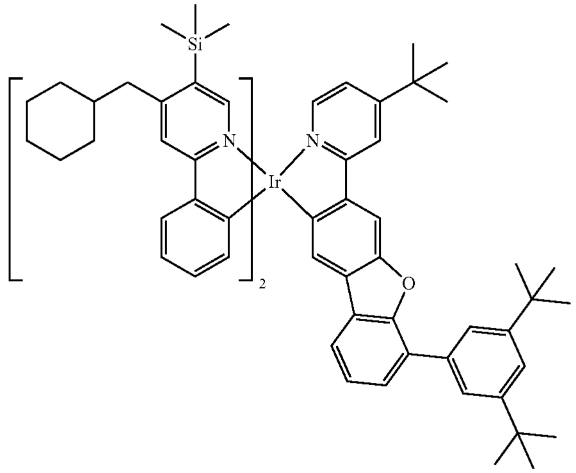
1325
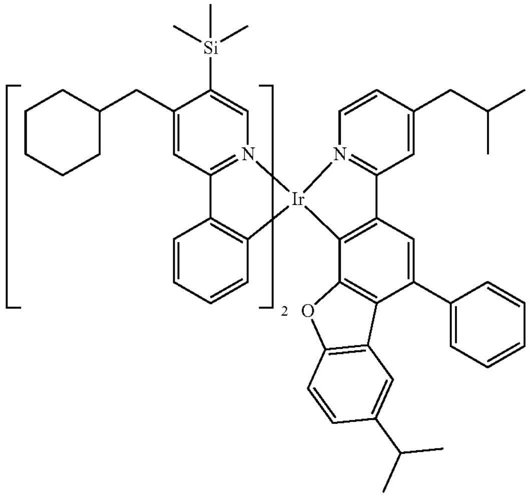
-continued
1326
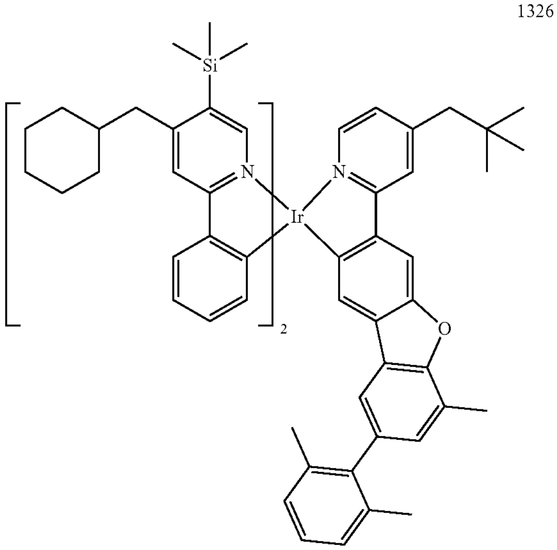
1327
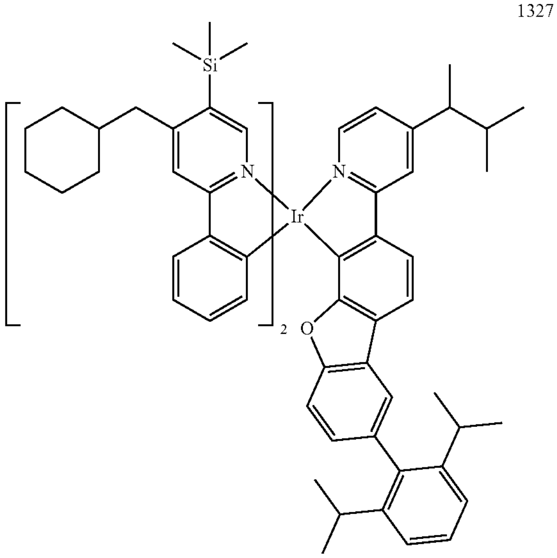
1328
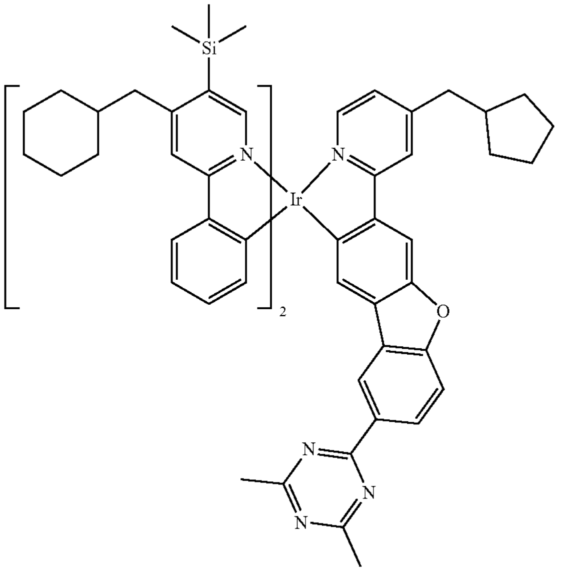

1329
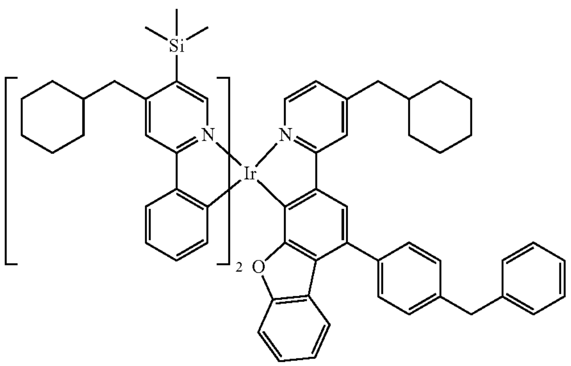
1330
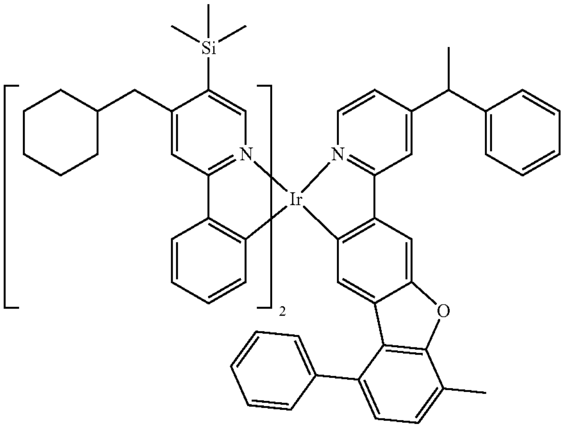
1331
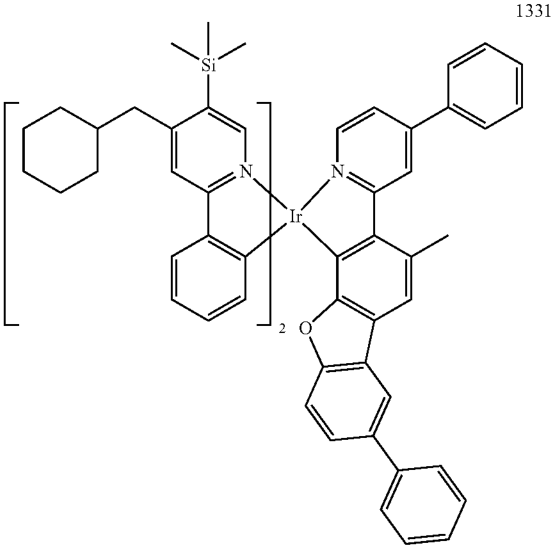
1332
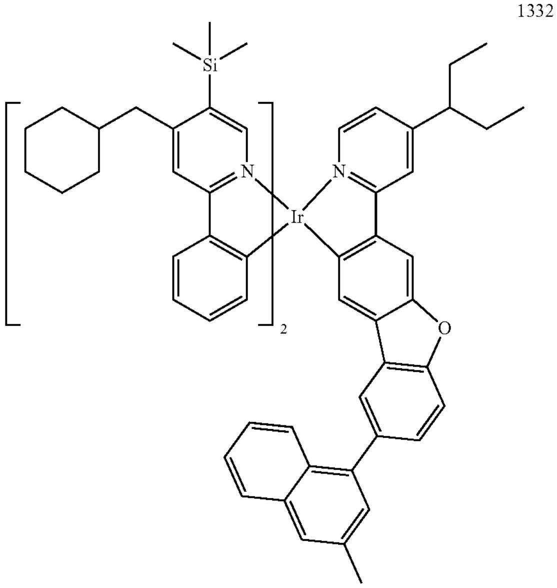
1333
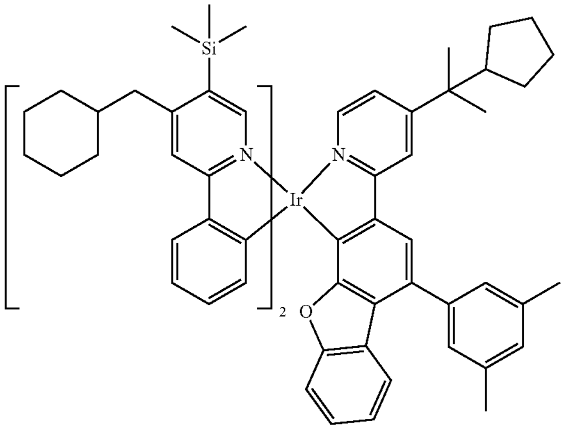
1334
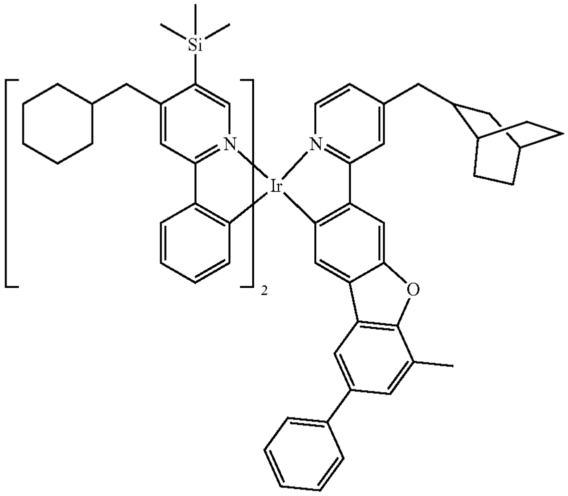

-continued
1335
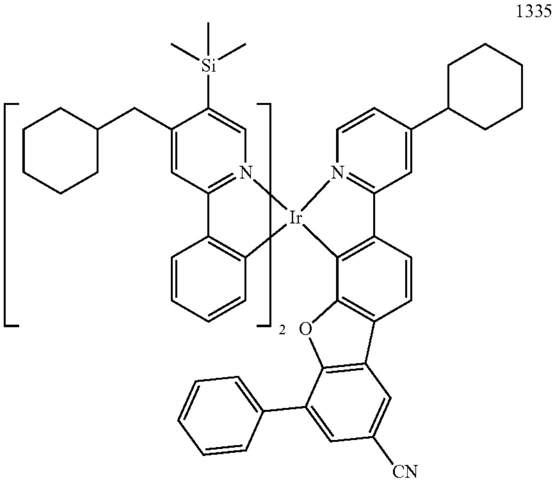
1336
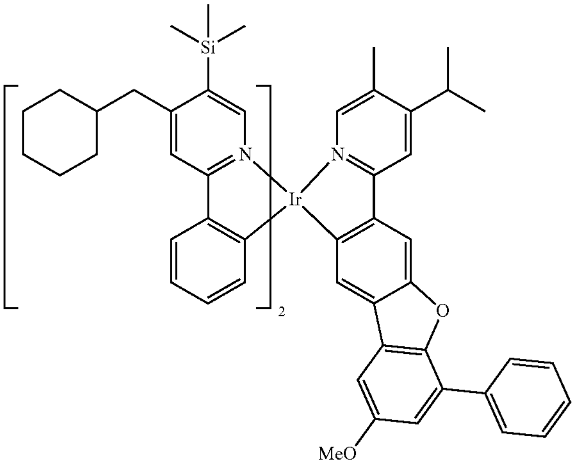
1337
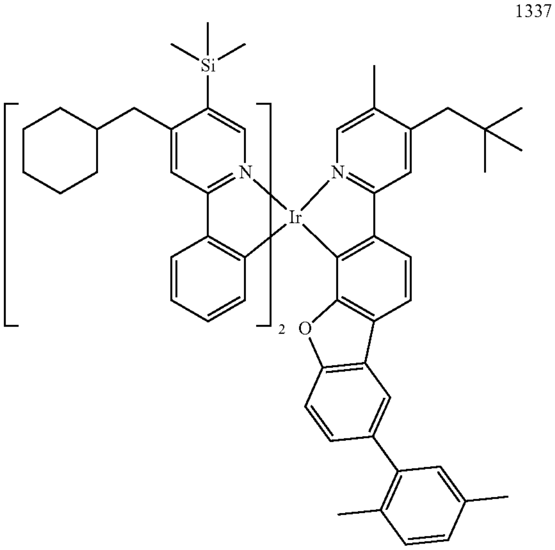
-continued
1338
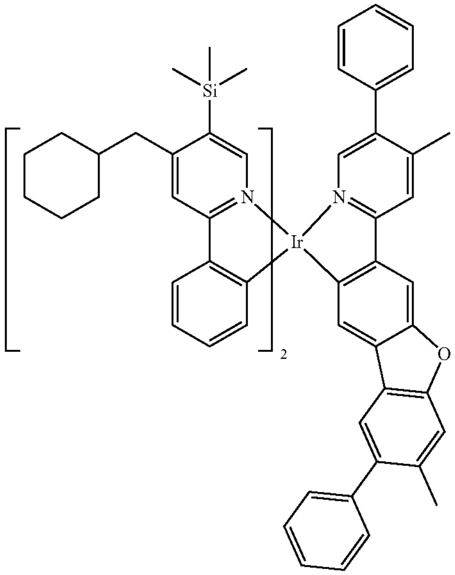
1339
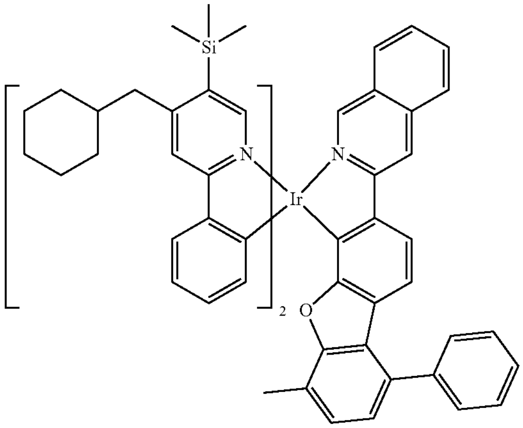
1340
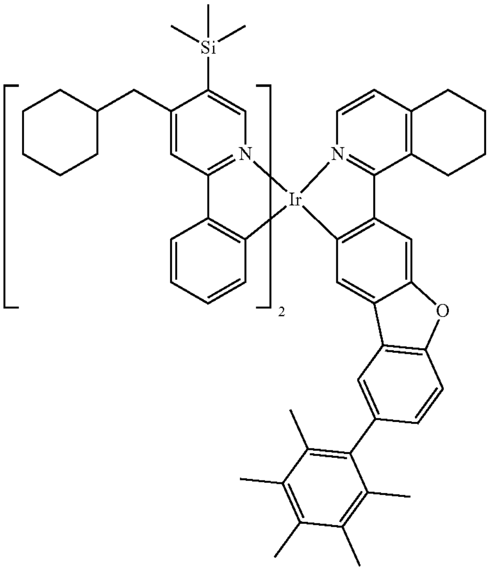

-continued
1341
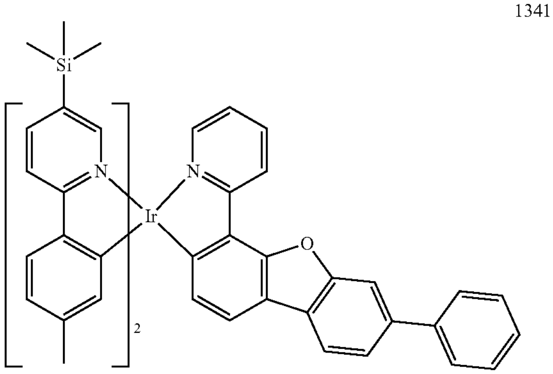
1342
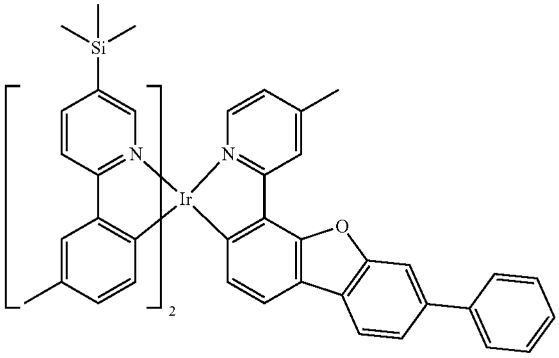
1343
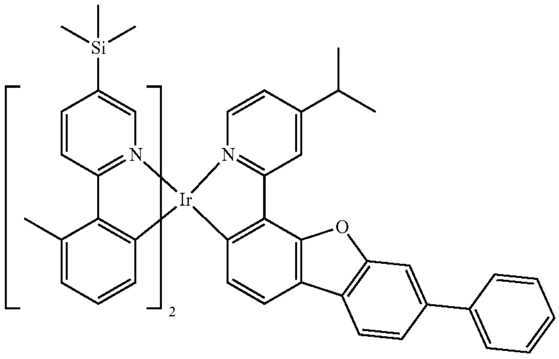
1344
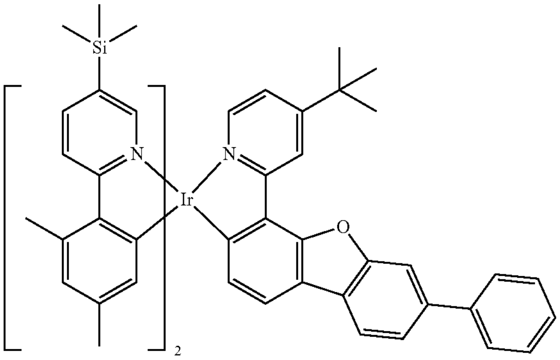
-continued
1345
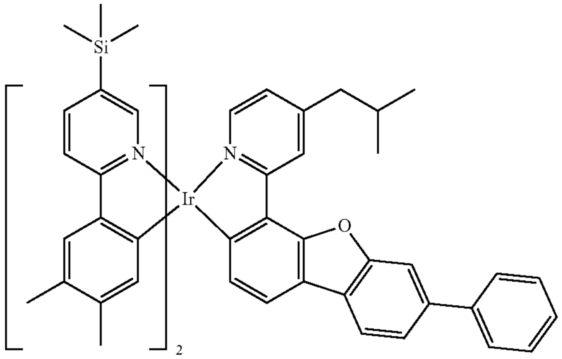
1346
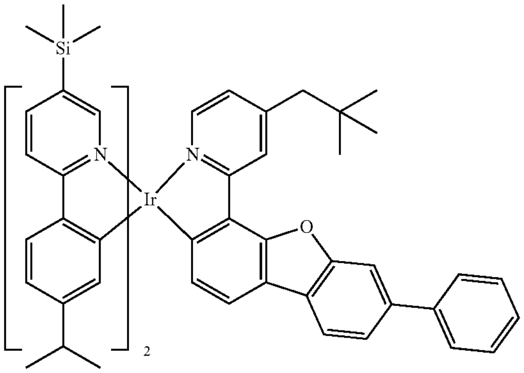
1347
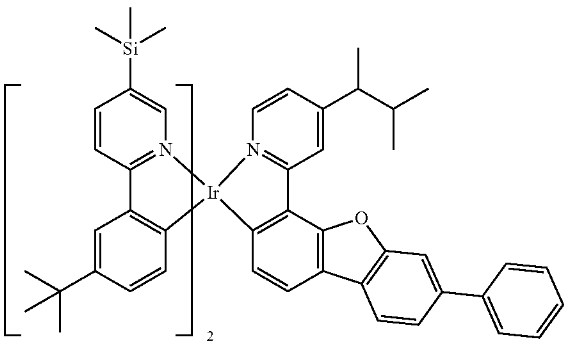
1348
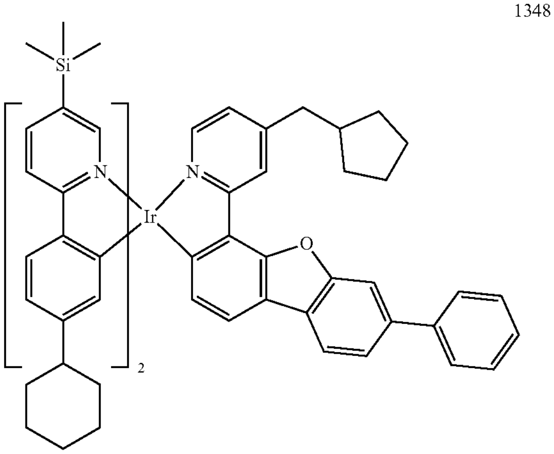

-continued
1349
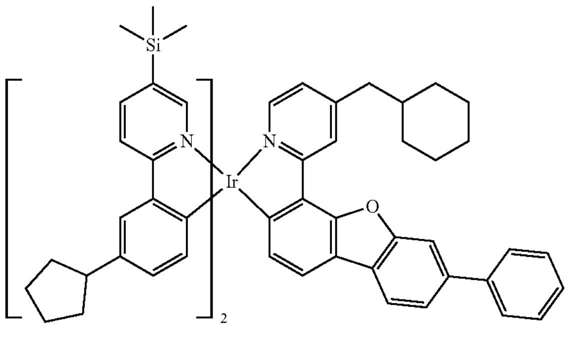
1350
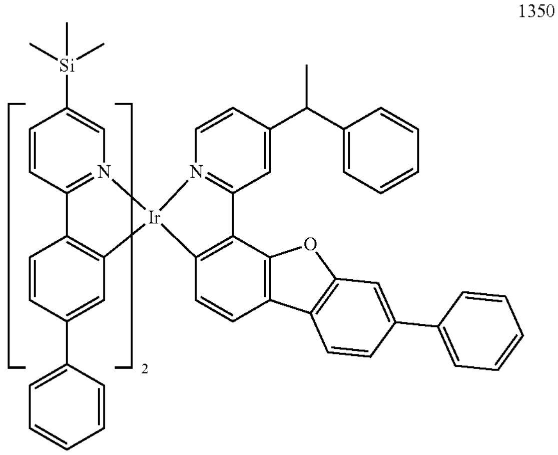
1351
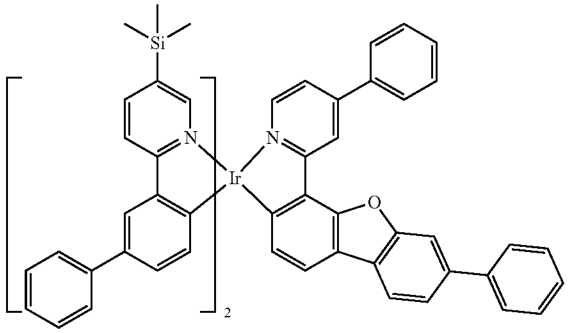
1352
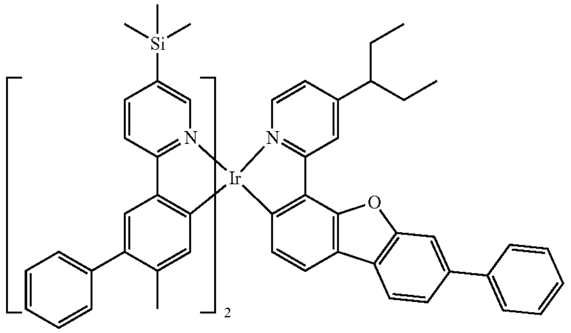
-continued
1353
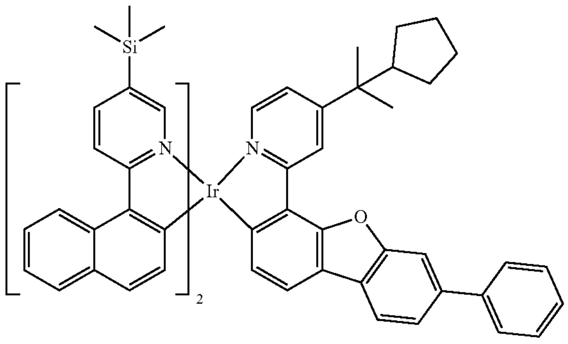
1354
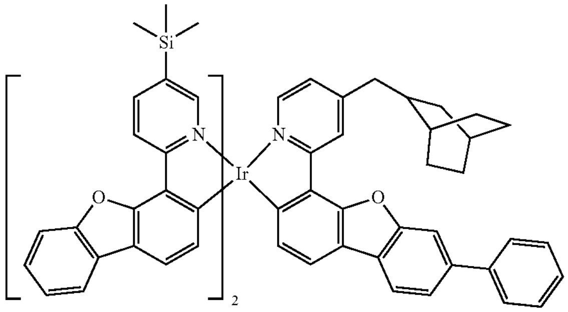
1355
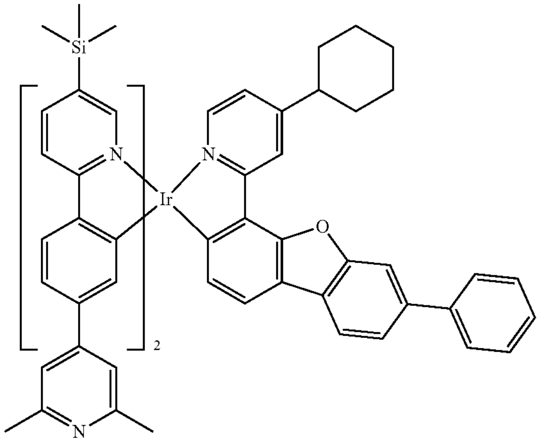
1356
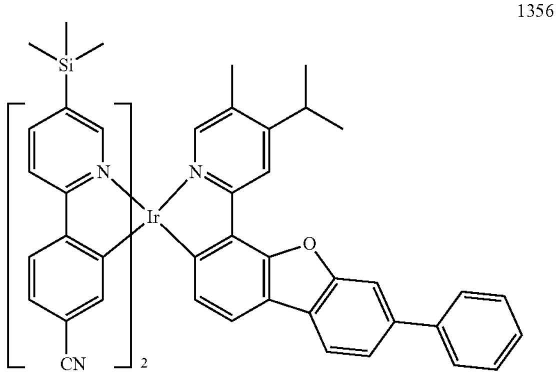

-continued
1357
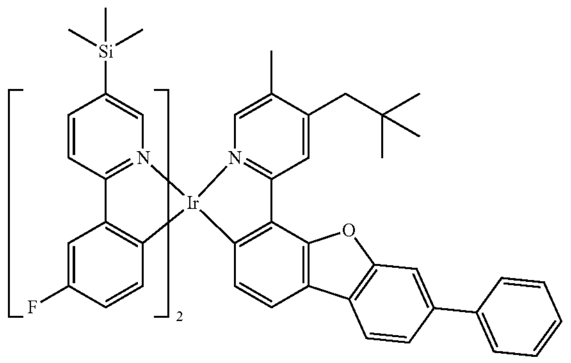
1358
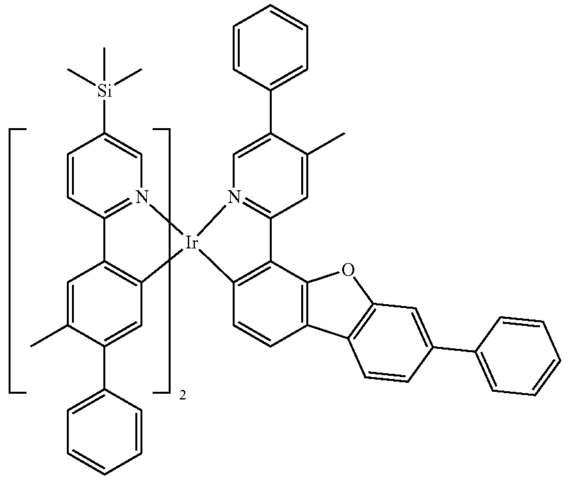
1359
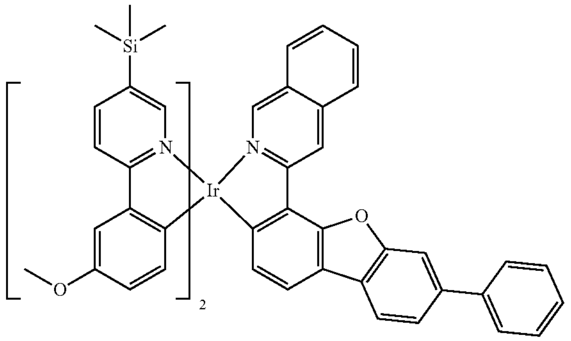
1360
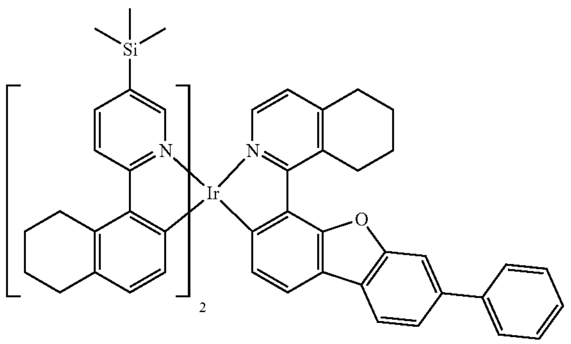
-continued
1361
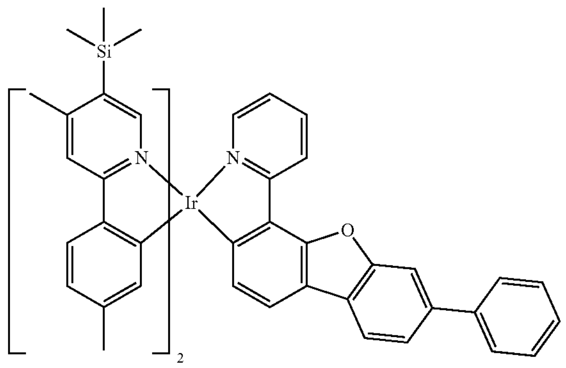
1362
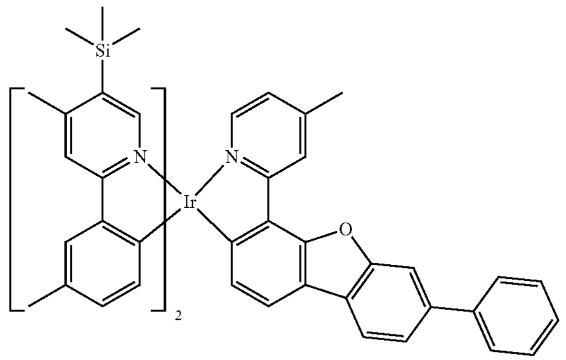
1363
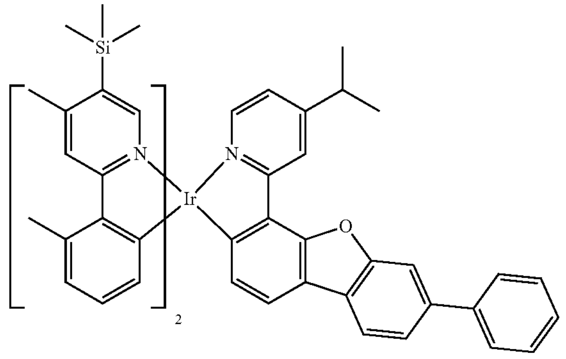
1364
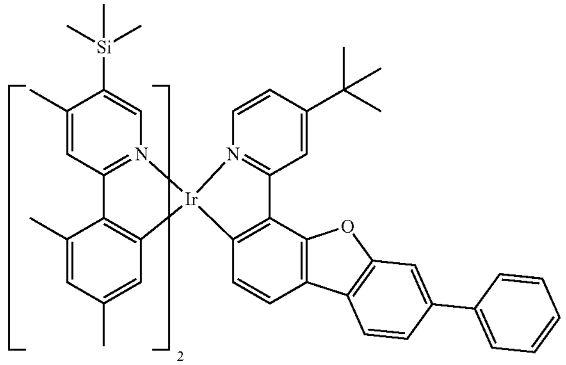

1365
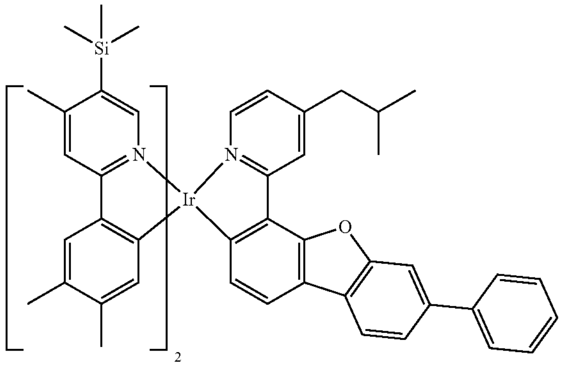
1366
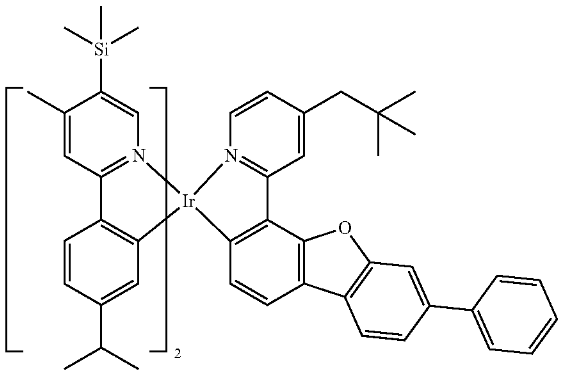
1367
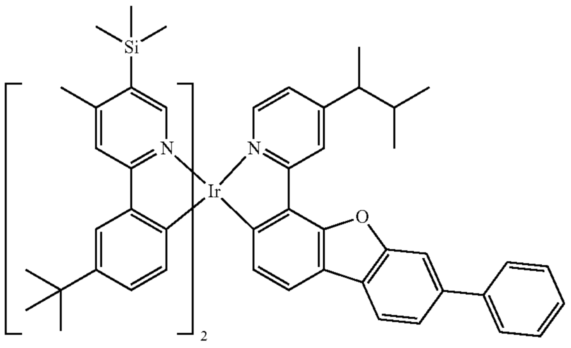
1368
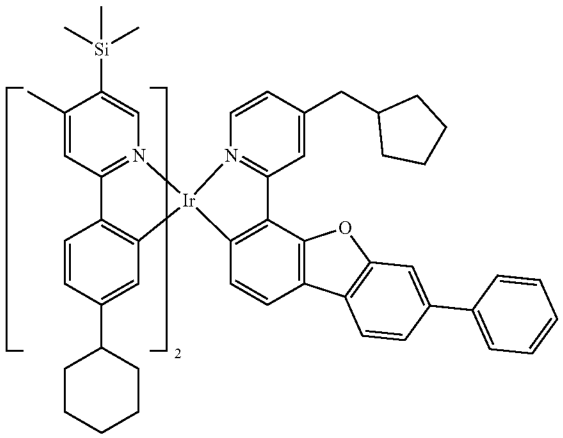
1369
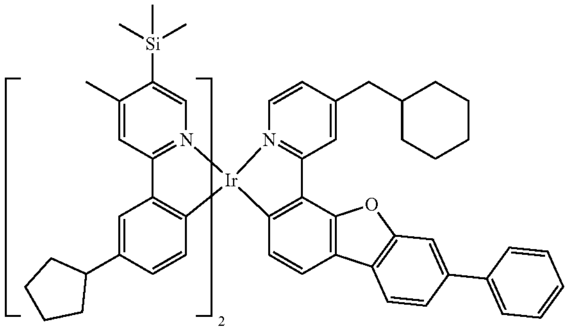
1370
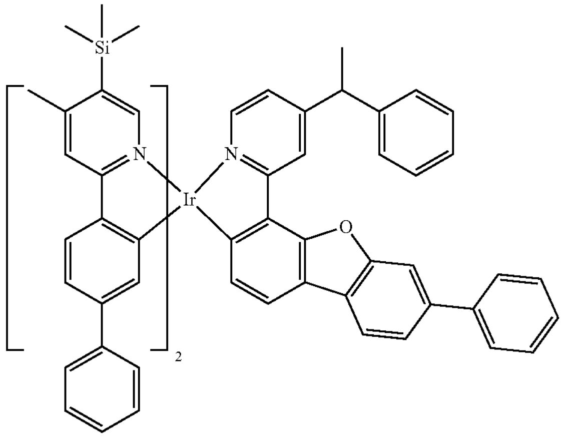
1371
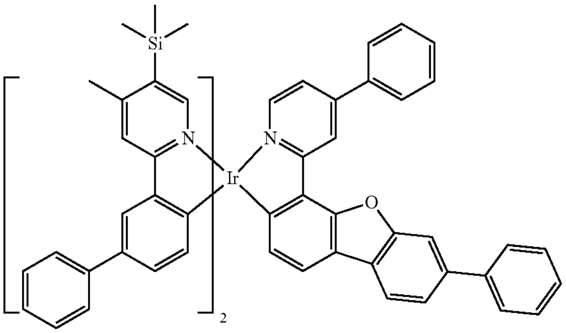
1372
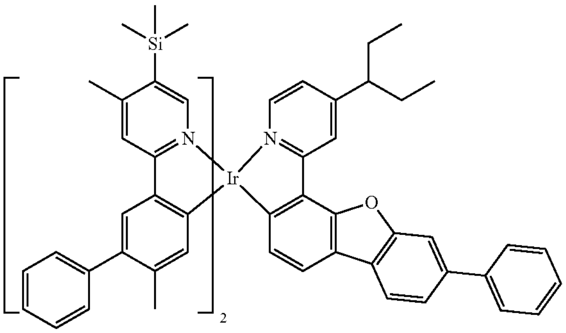

1373
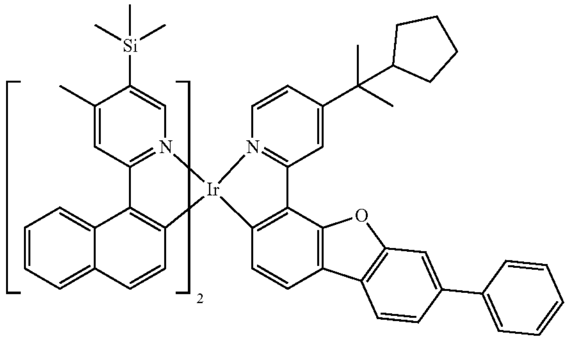
1374
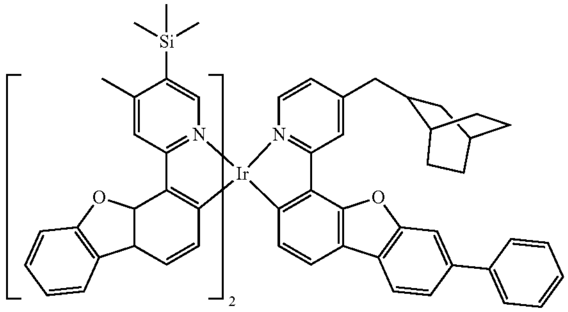
1375
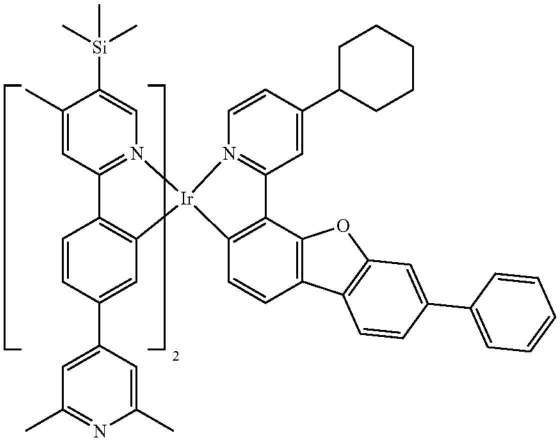
1376
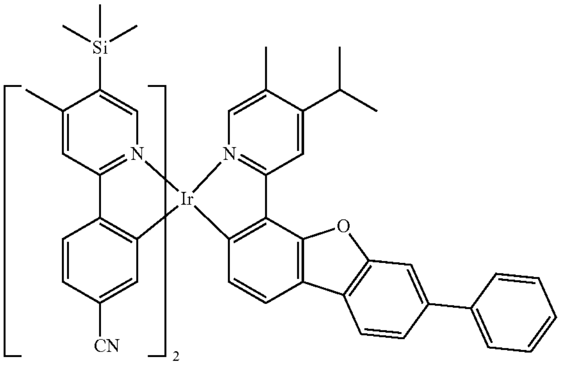
1377
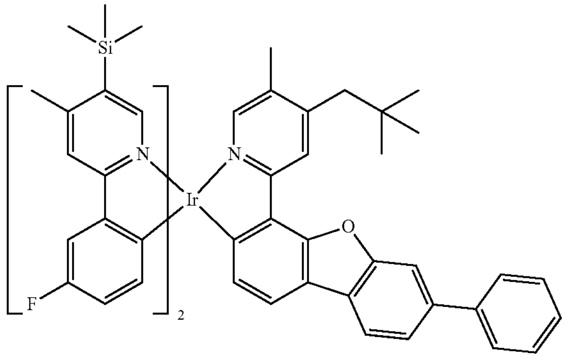
1378
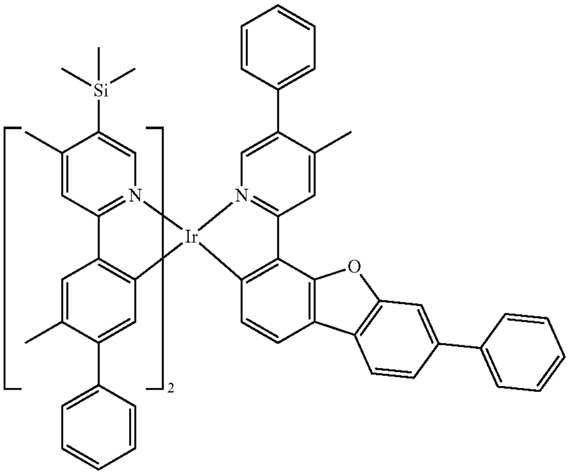
1379
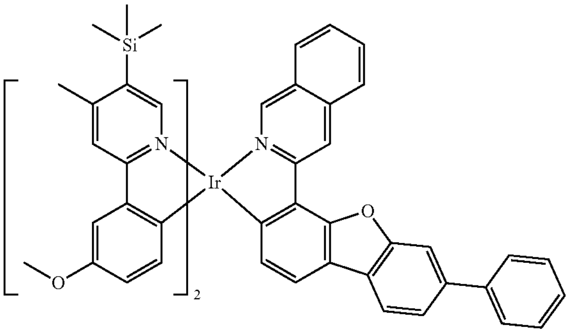

1380
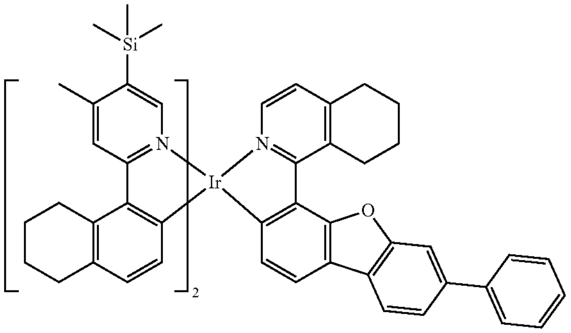
1381
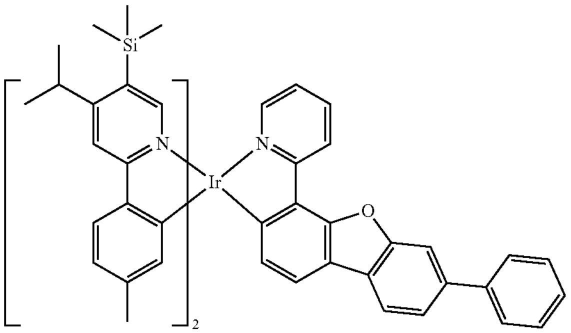
1382
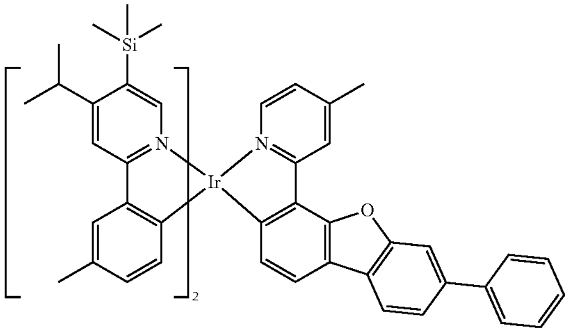
1383
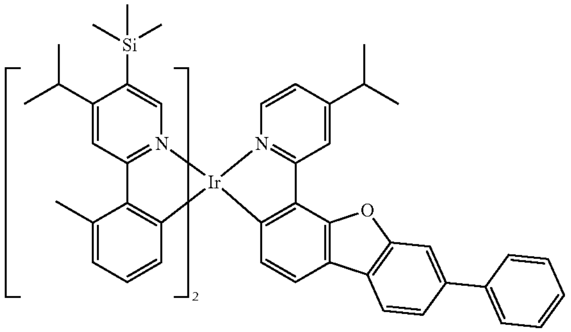
1384
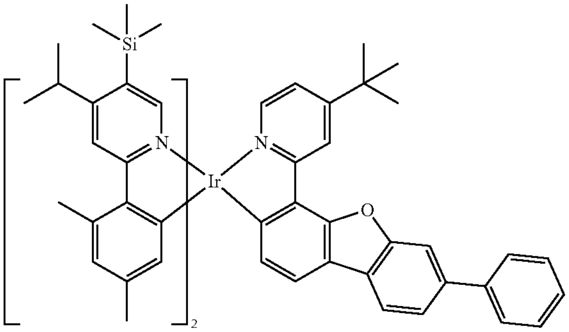
1385
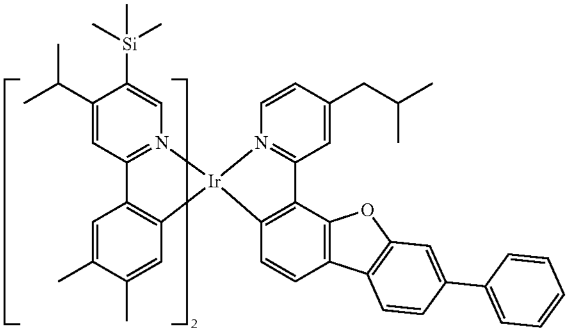
1386
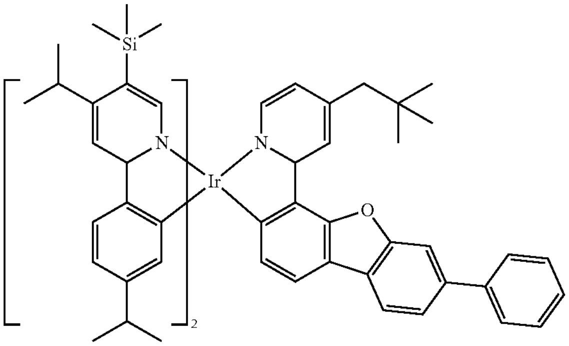
1387
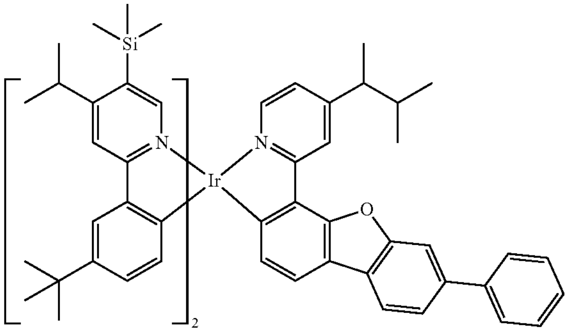

-continued
1388
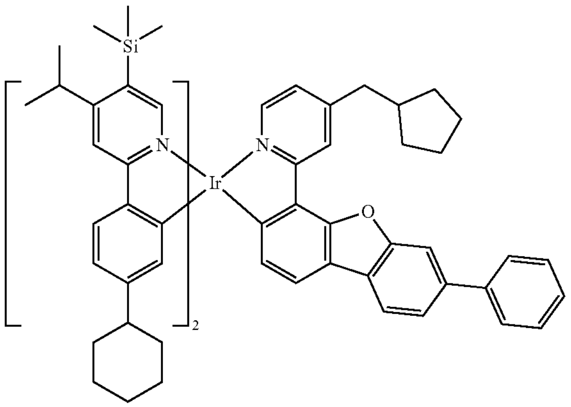
1389
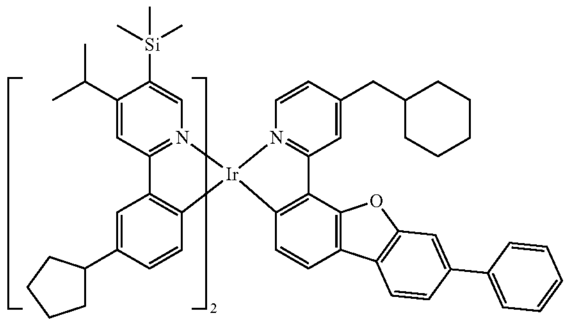
1390
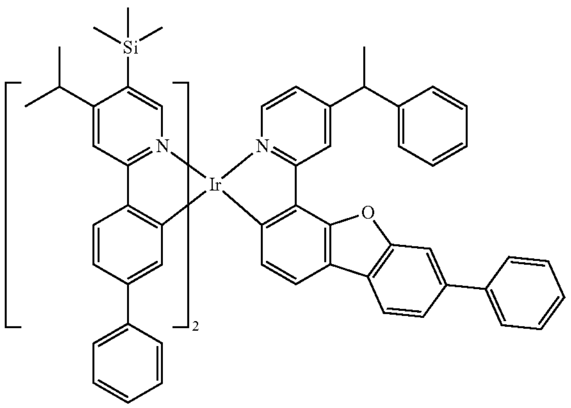
1391
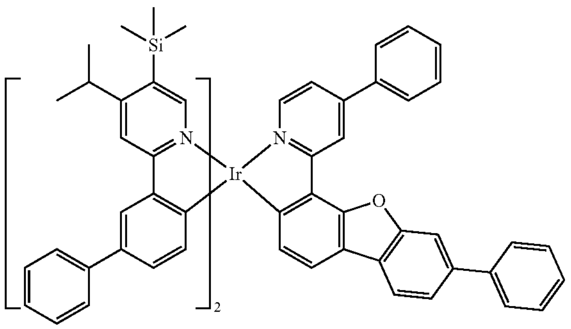
-continued
1392
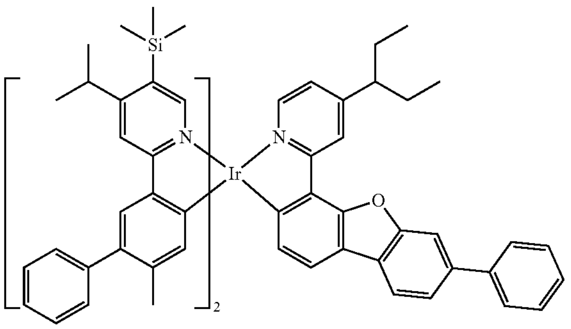
1393
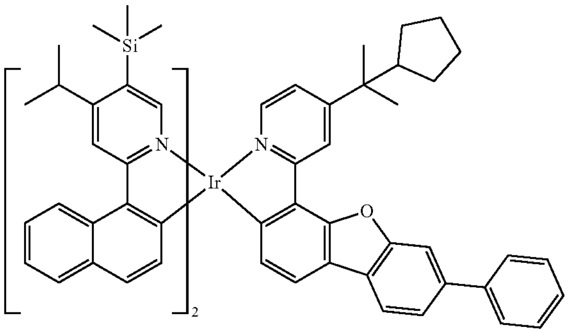
1394
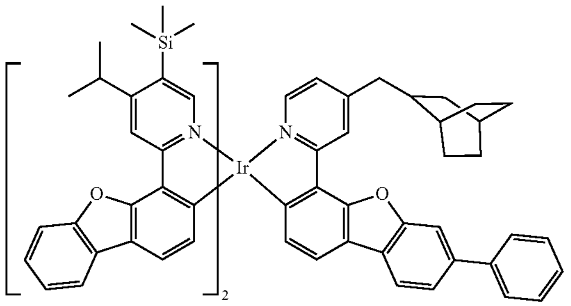
1395
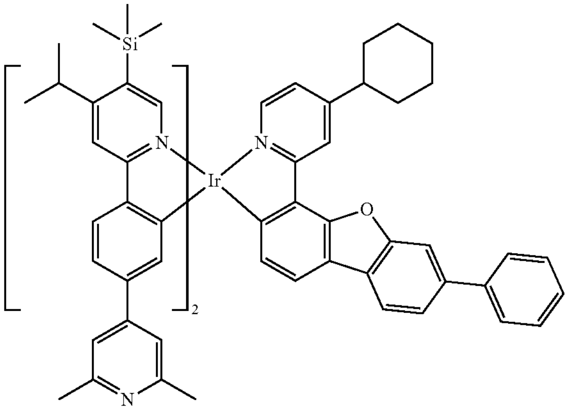

1396
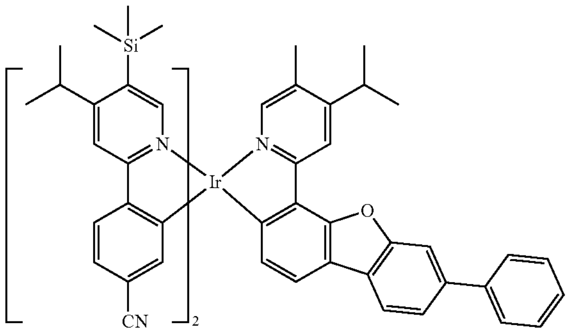
1397
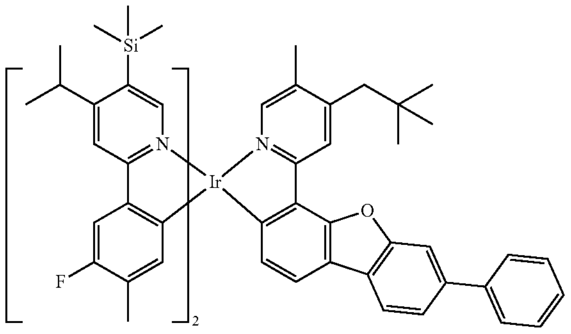
1398
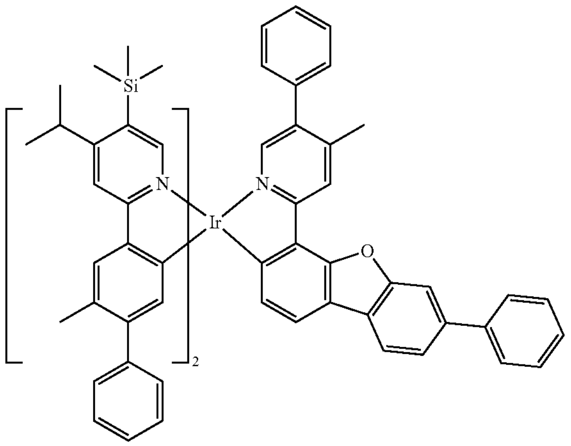
1399
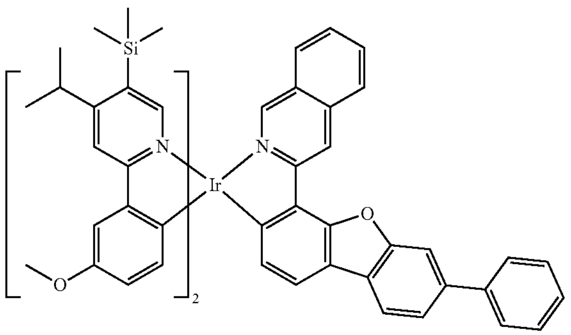
-continued
1400
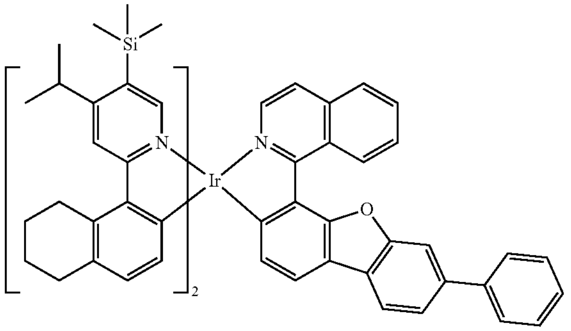
1401
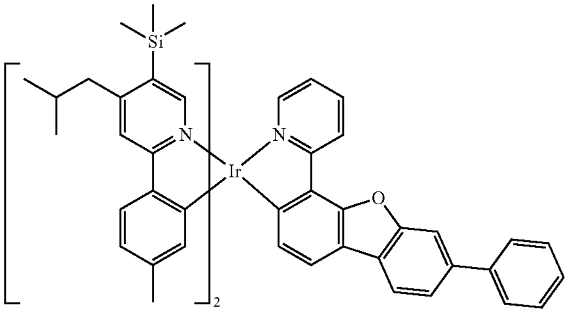
1402
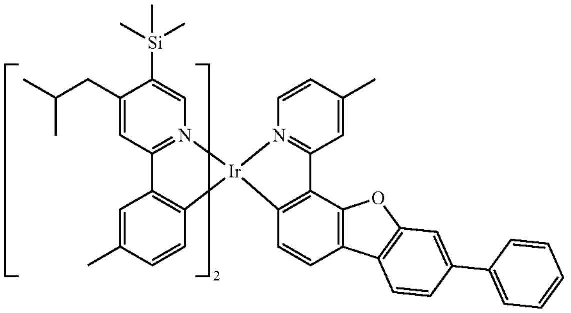
1403
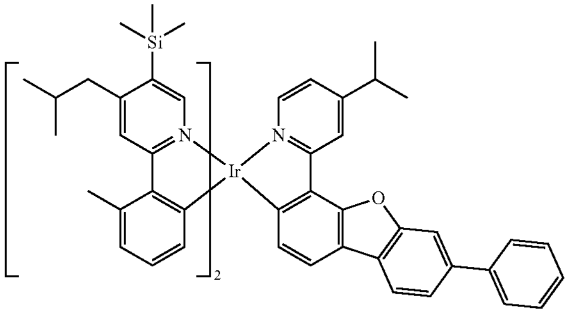

-continued
1404
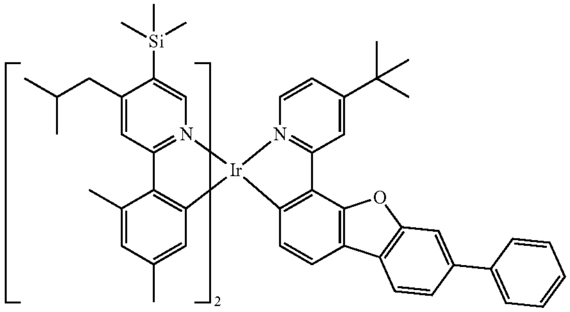
1405
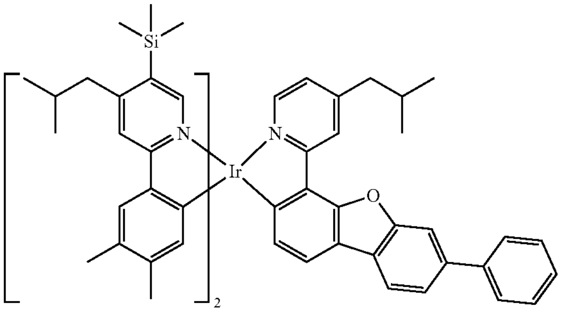
1406
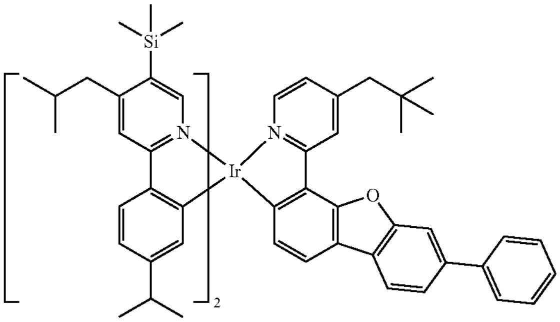
1407
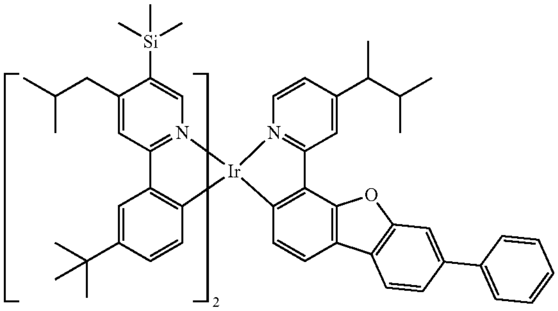
-continued
1408
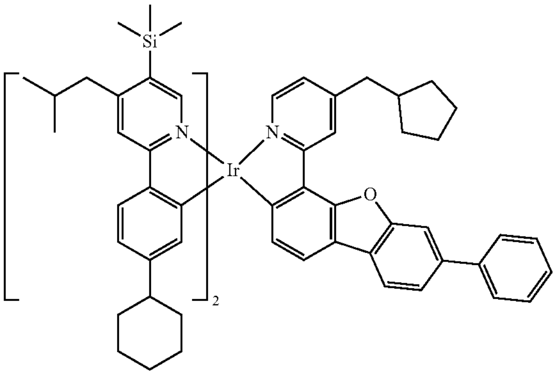
1409
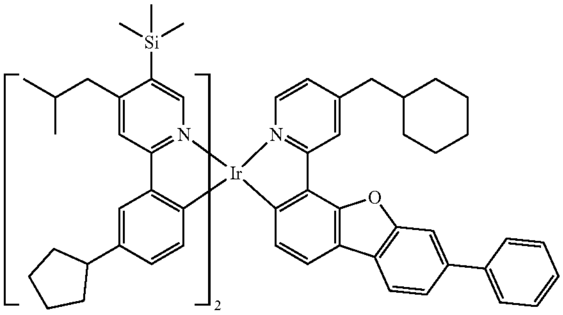
1410
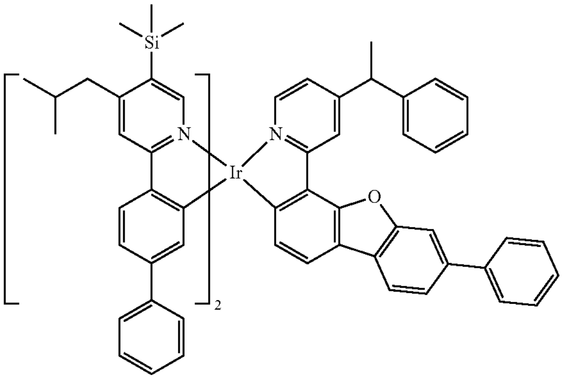
1411
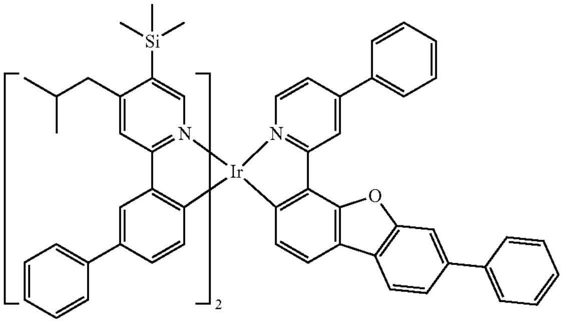

-continued
1412
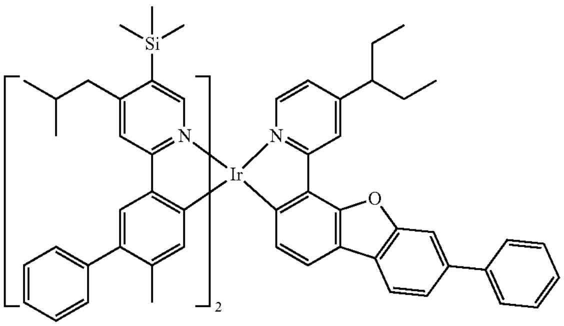
1413
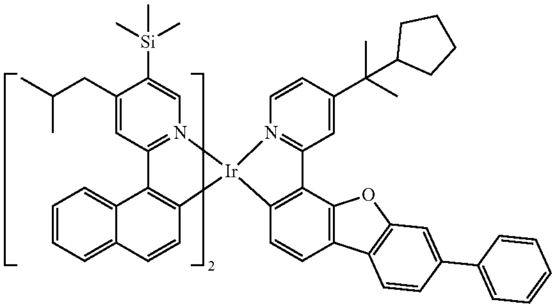
1414
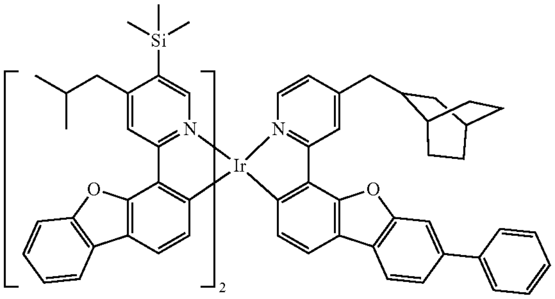
1415
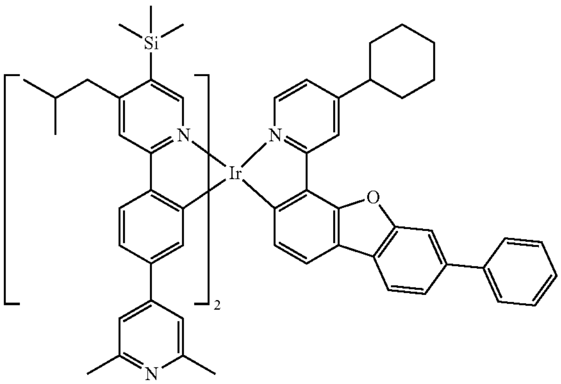
-continued
1416
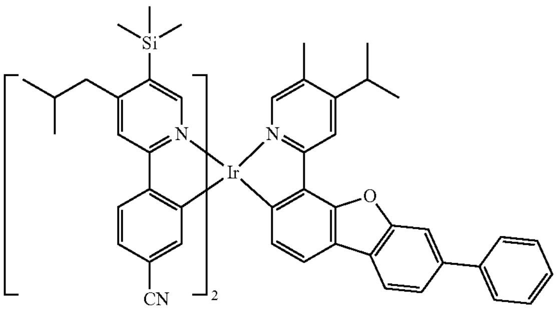
1417
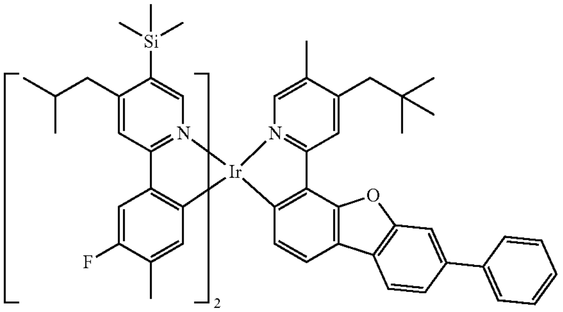
1418
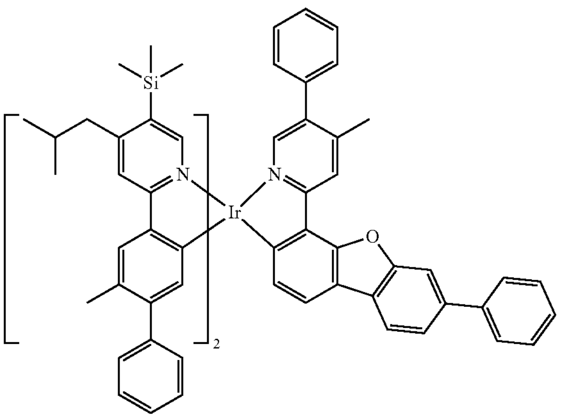
1419
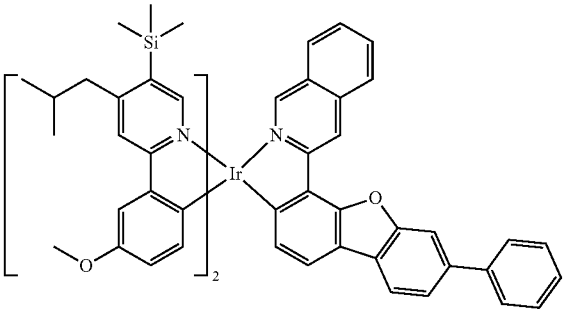

-continued
1420
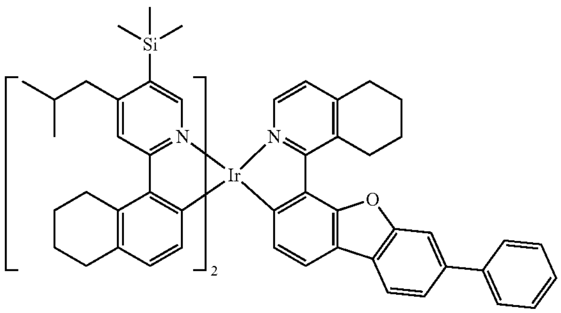
1421
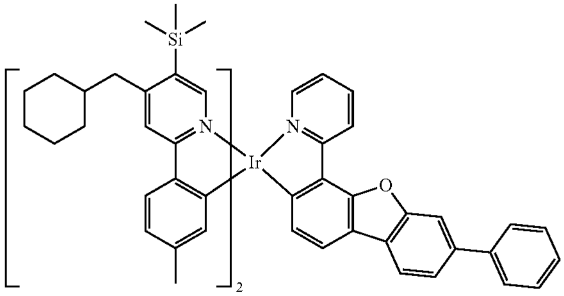
1422
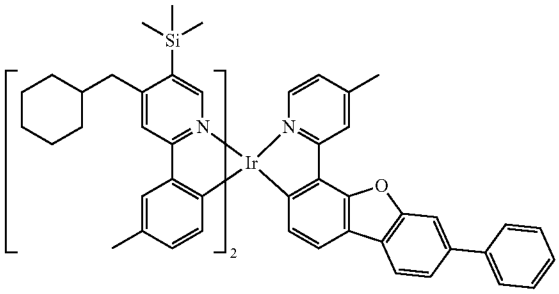
1423
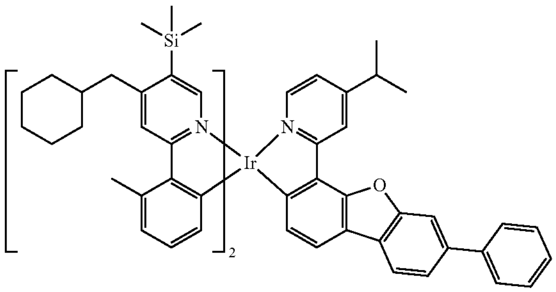
1424
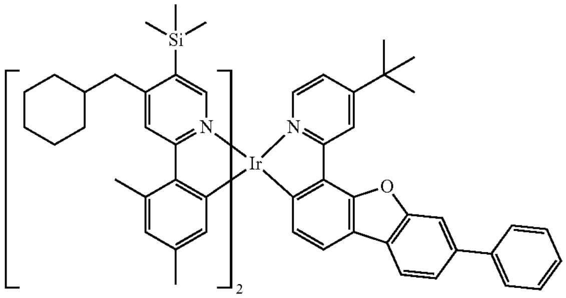
-continued
1425
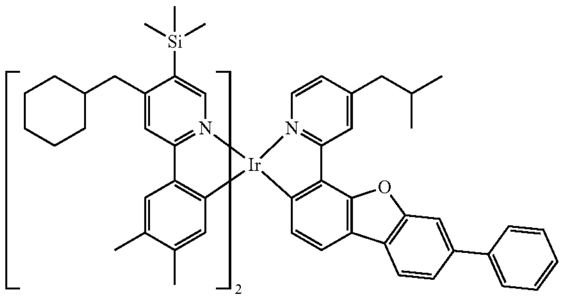
1426
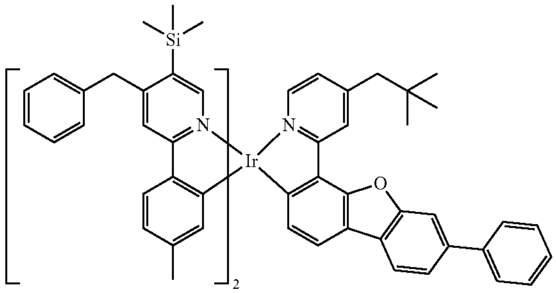
1427
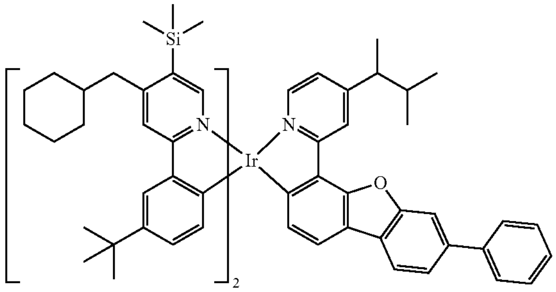
1428
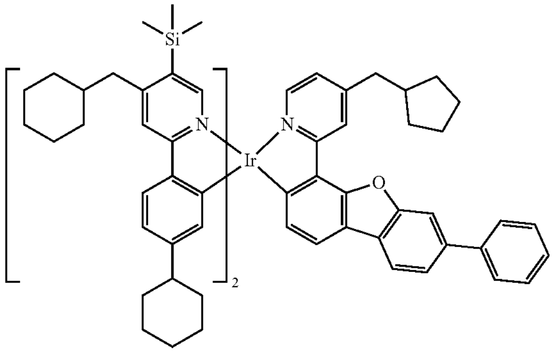
1429
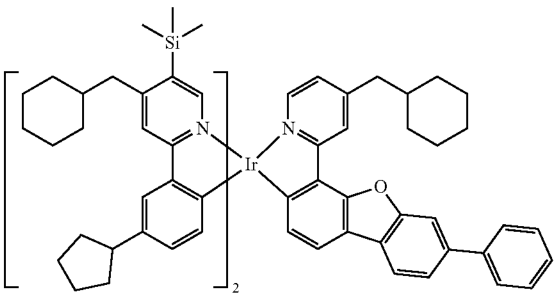

-continued
1430
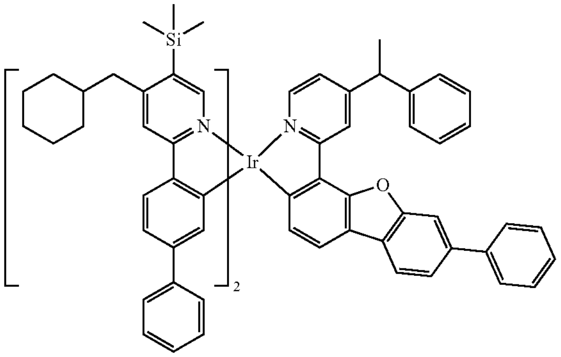
1431
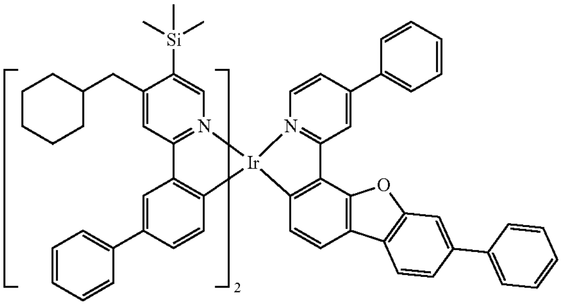
1432
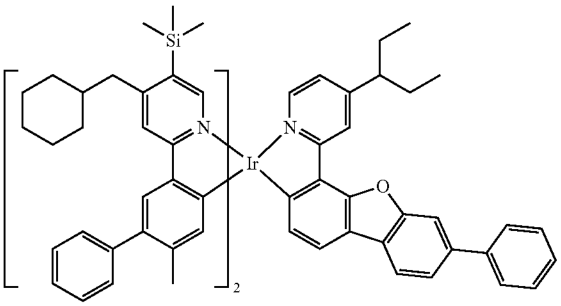
1433
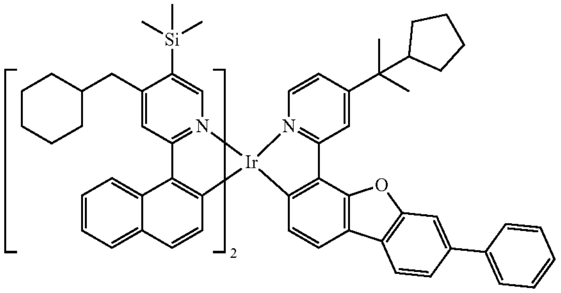
-continued
1434
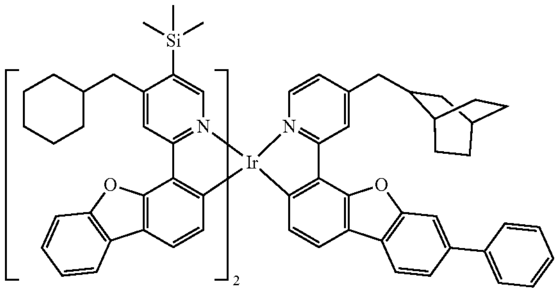
1435
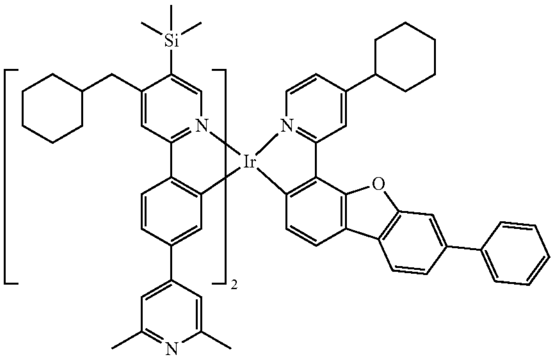
1436
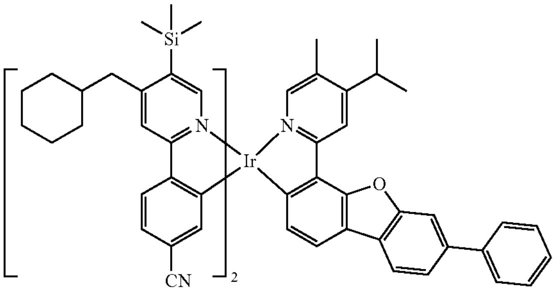
1437
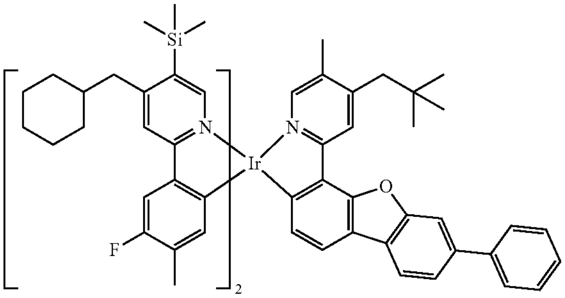

-continued
1438
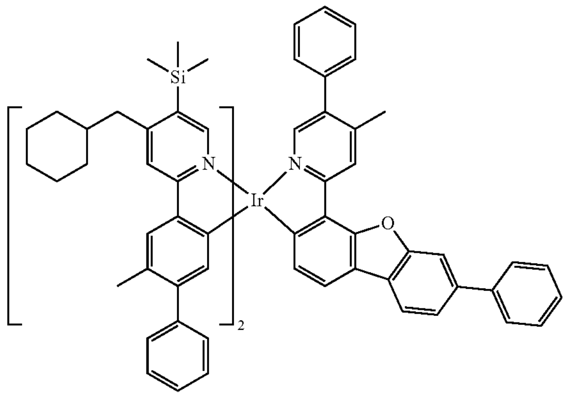
1439
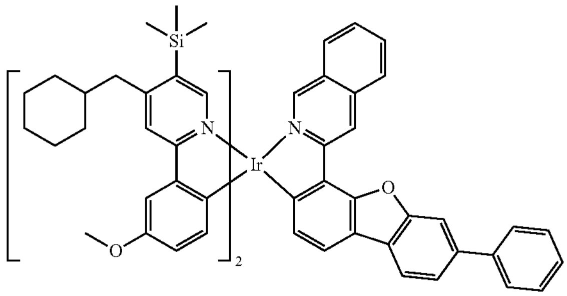
1440
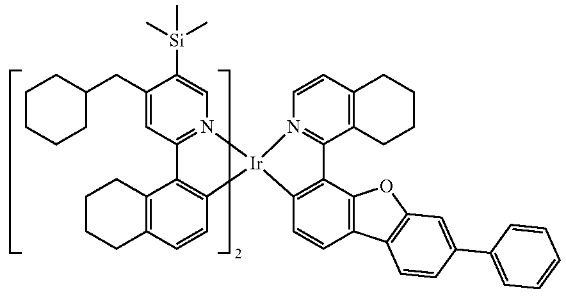
1441
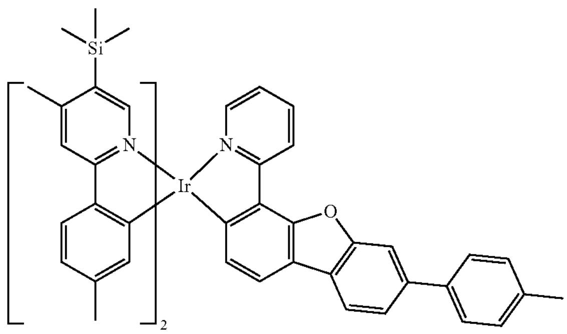
-continued
1442
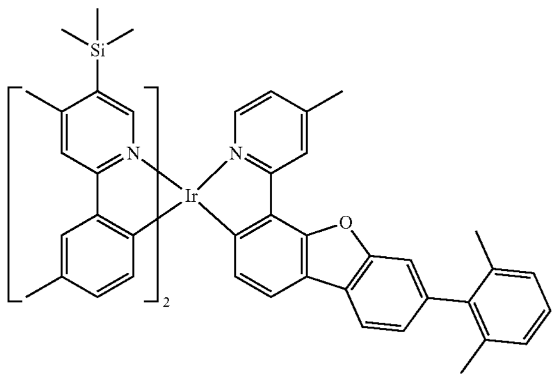
1443
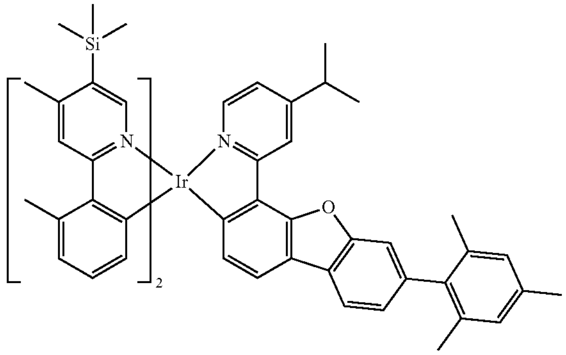
1444
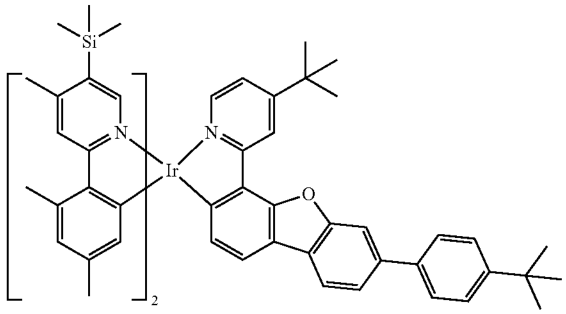
1445
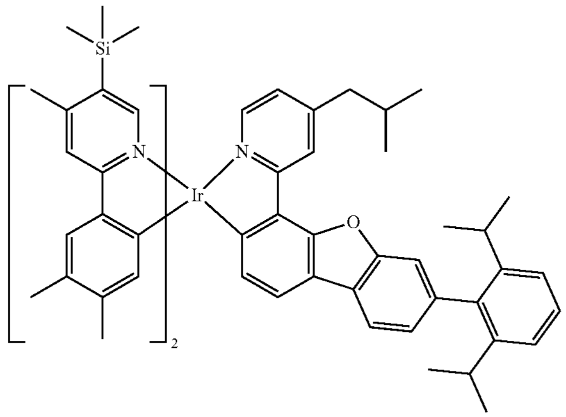

-continued
1446
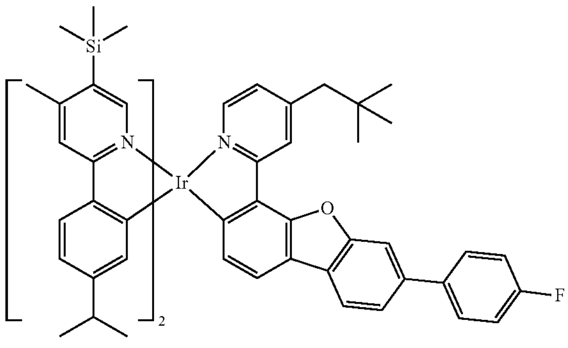
1447
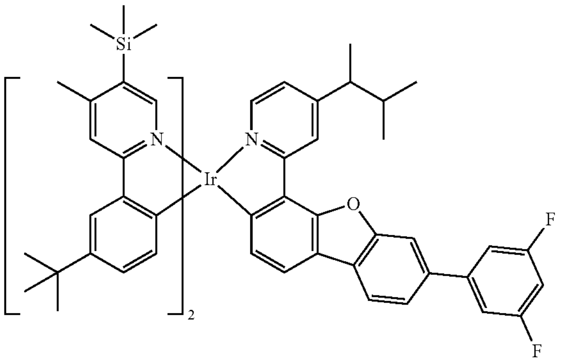
1448
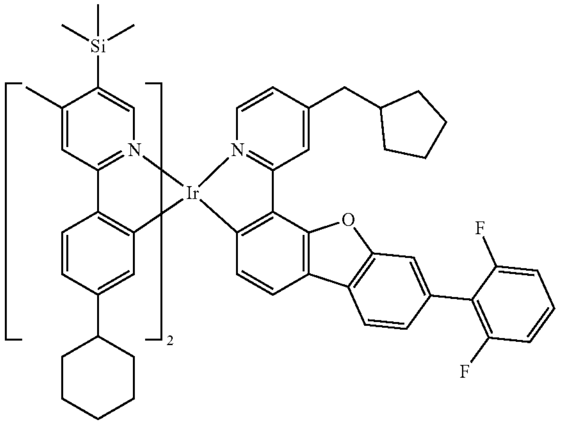
1449
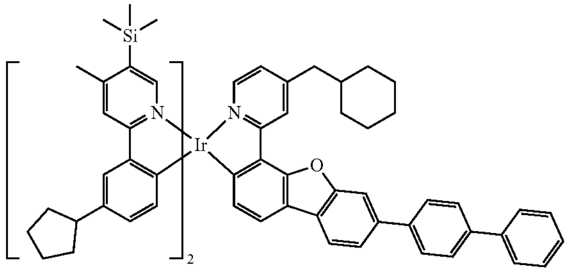
-continued
1450
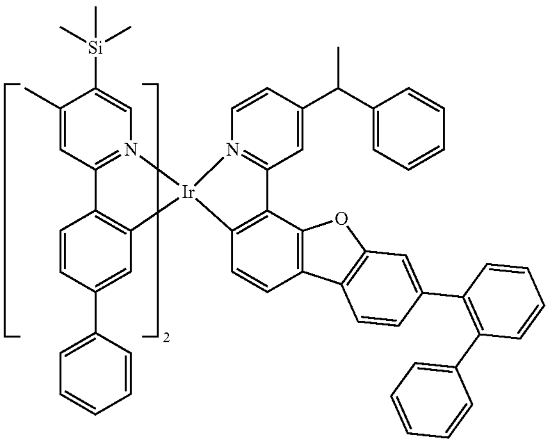
1451
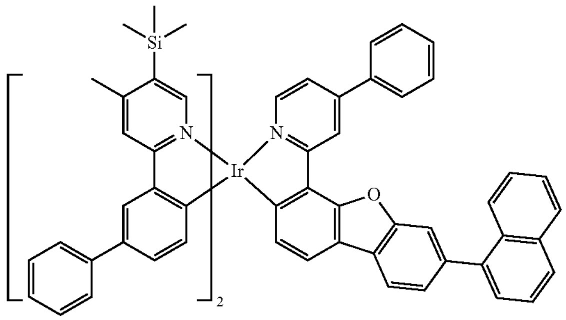
1452
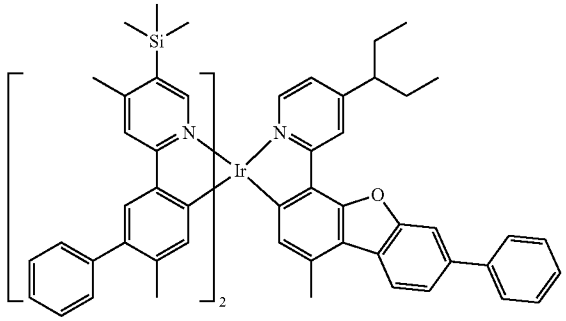
1453
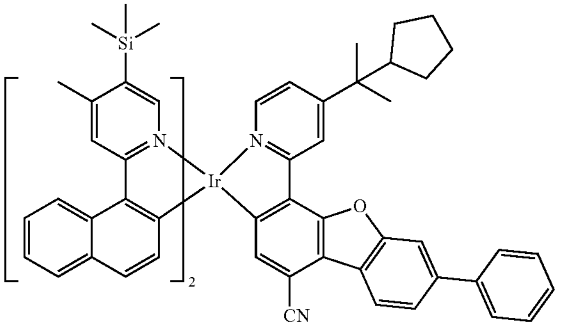

-continued
1454
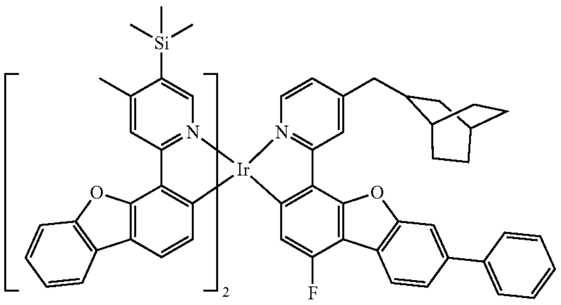
1455
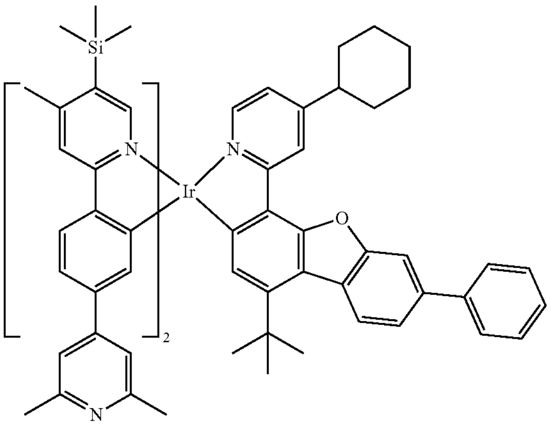
1456
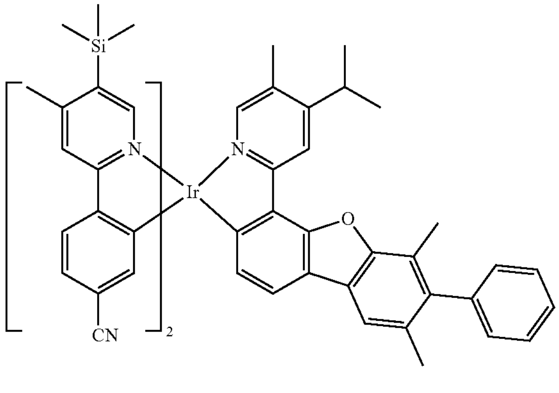
1457
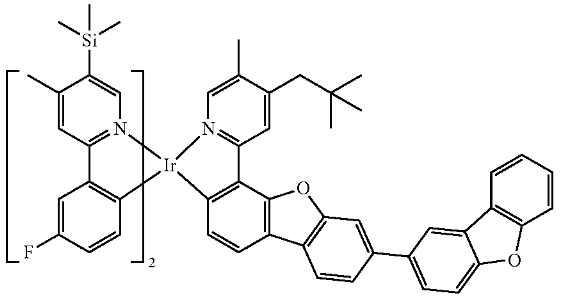
-continued
1458
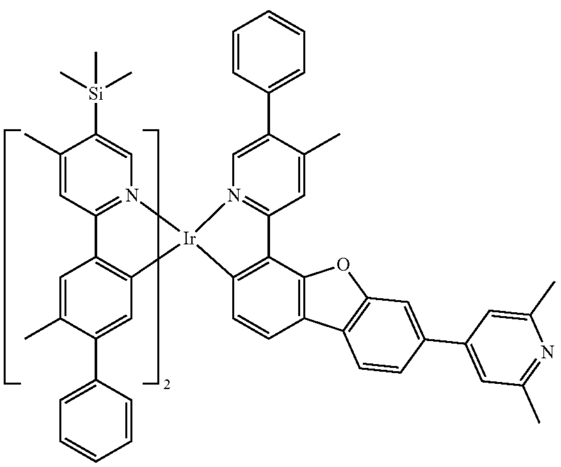
1459
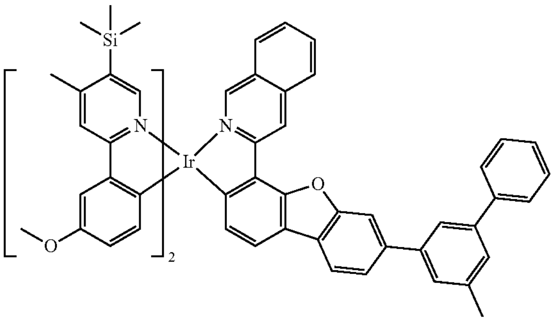
1460
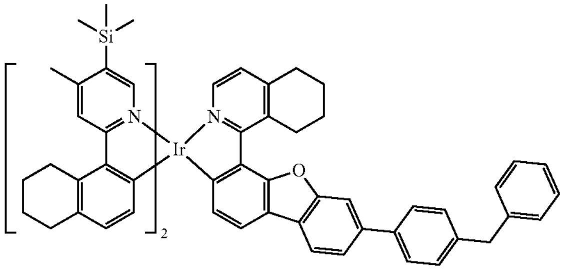
1461
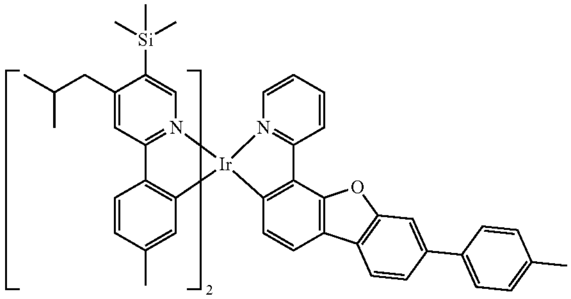

-continued
1462
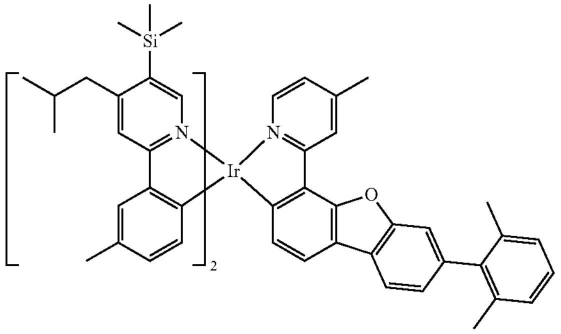
1463
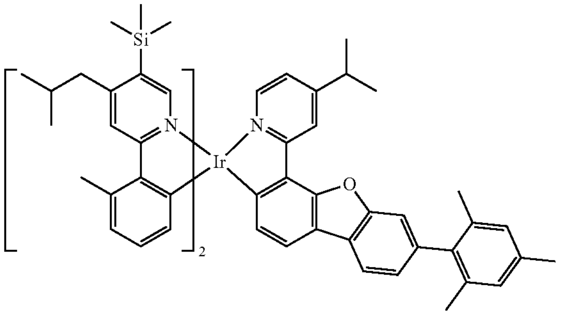
1464
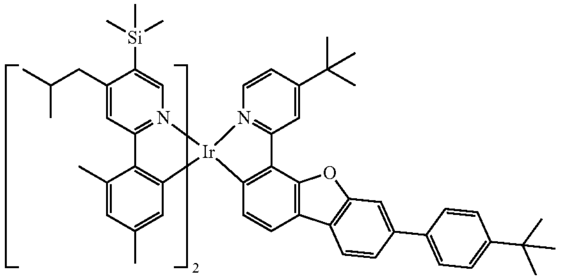
1465
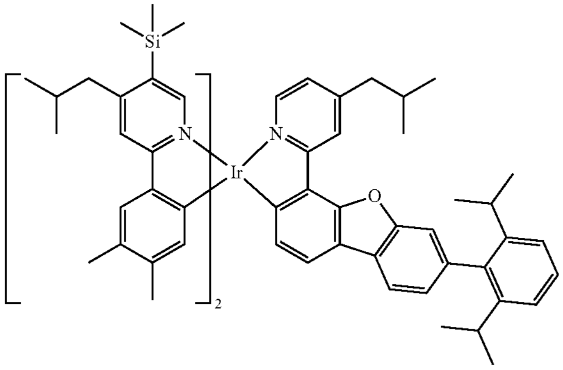
-continued
1466
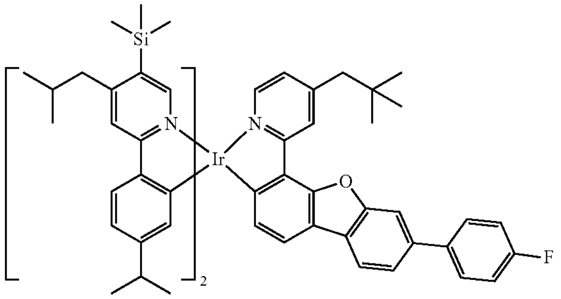
1467
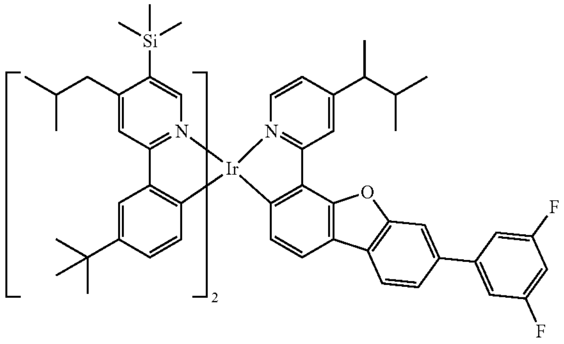
1468
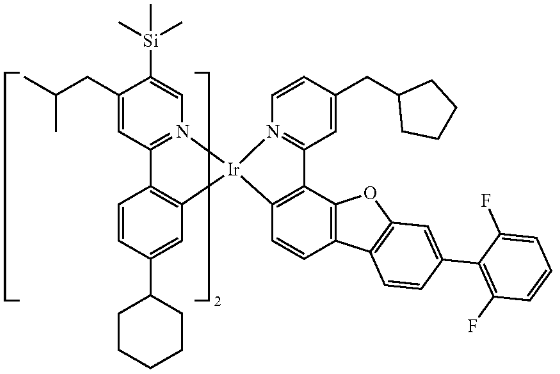
1469
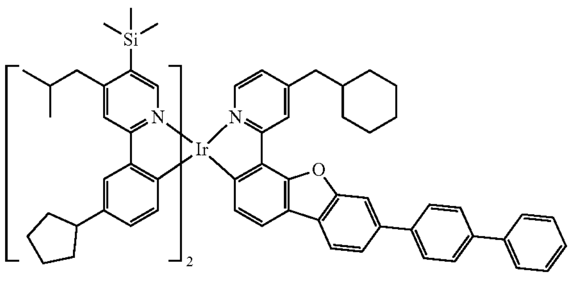

-continued
1470
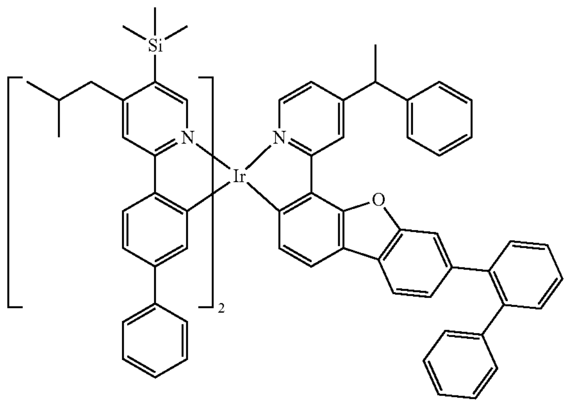
1471
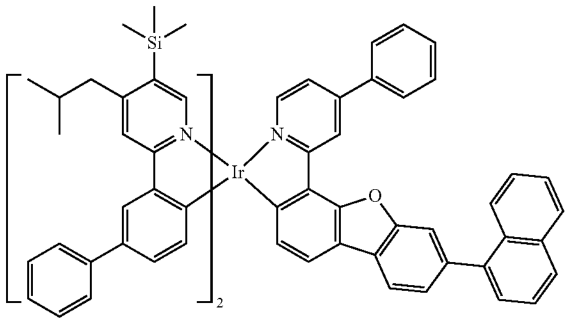
1472
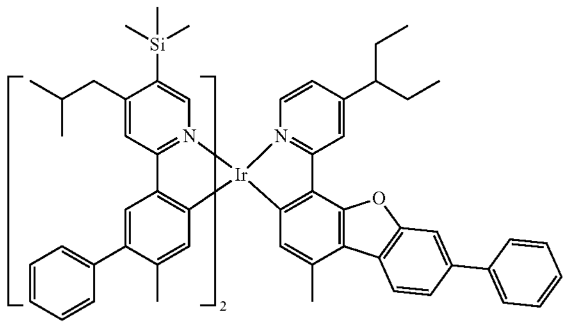
1473
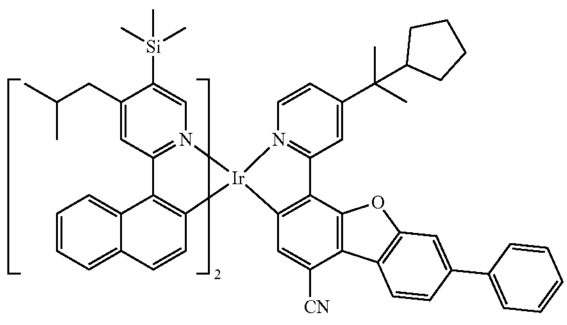
-continued
1474
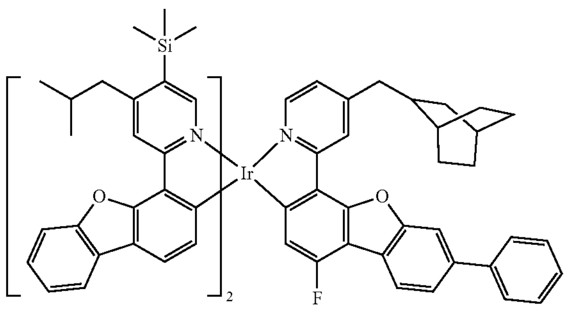
1475
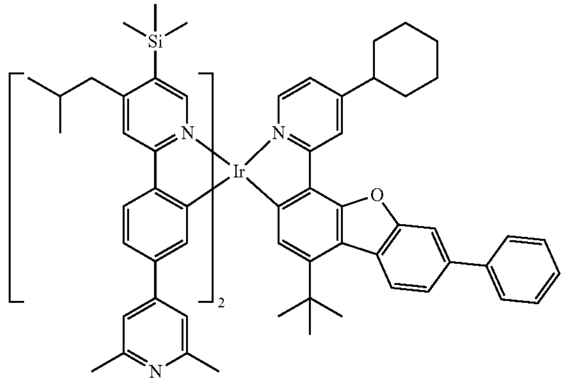
1476
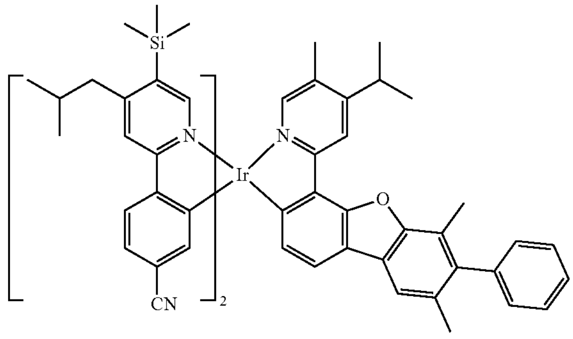
1477
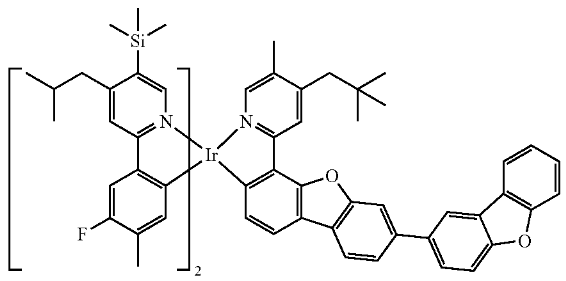

-continued
1478
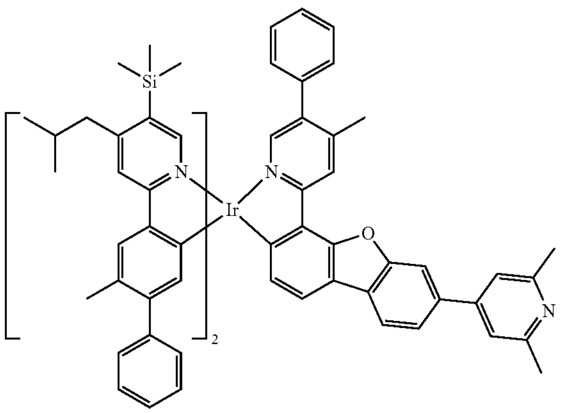
1479
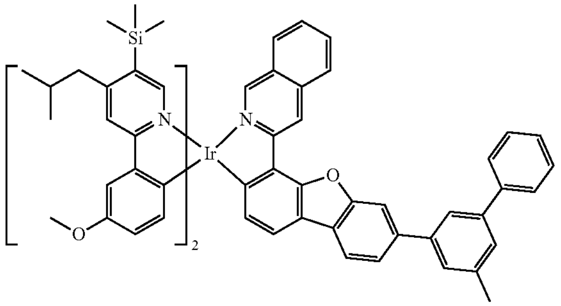
1480
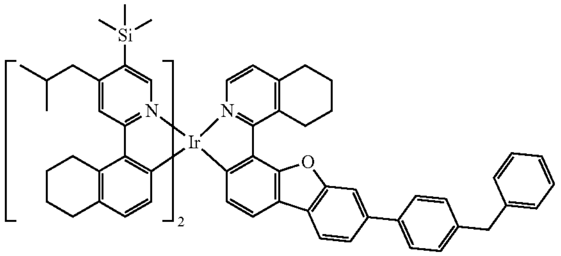
1481
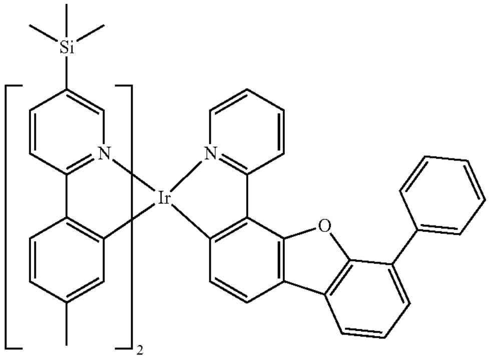
-continued
1482
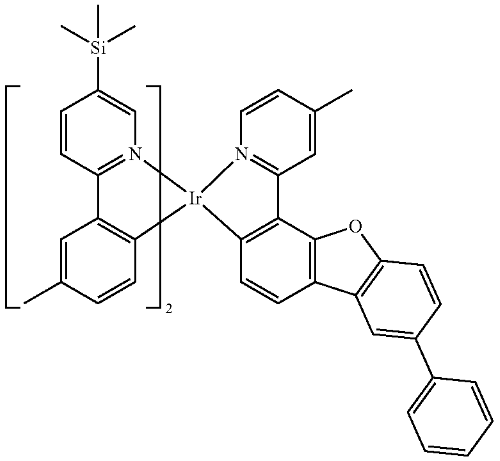
1483
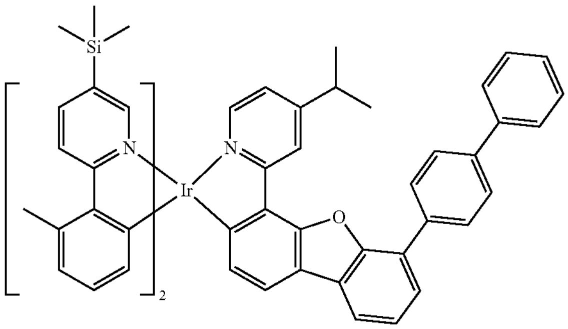
1484
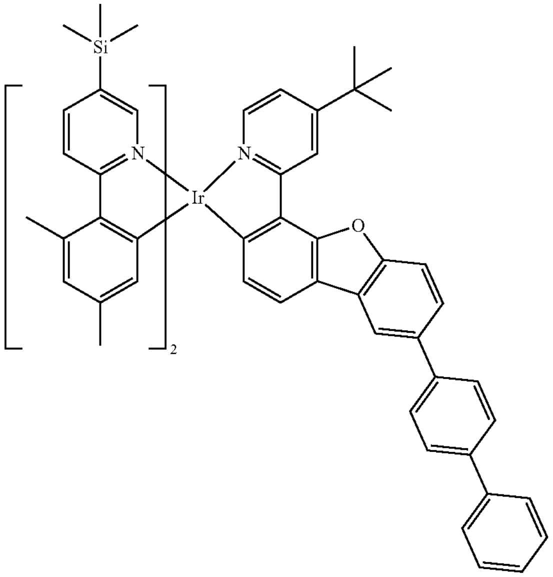

-continued
1485
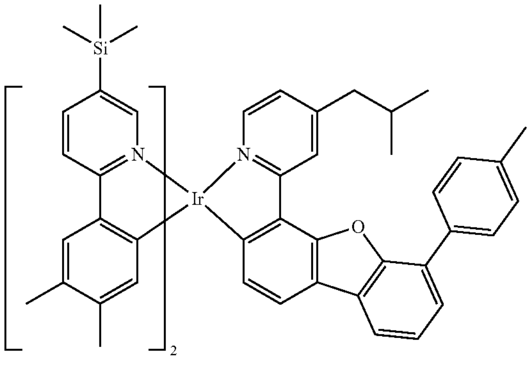
1486
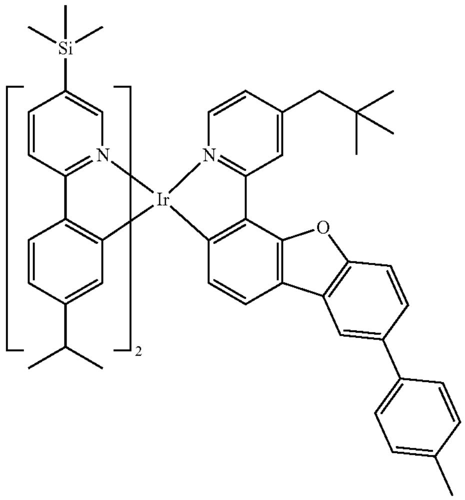
1487
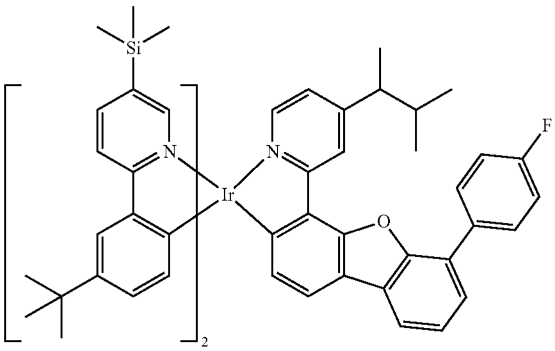
-continued
1488
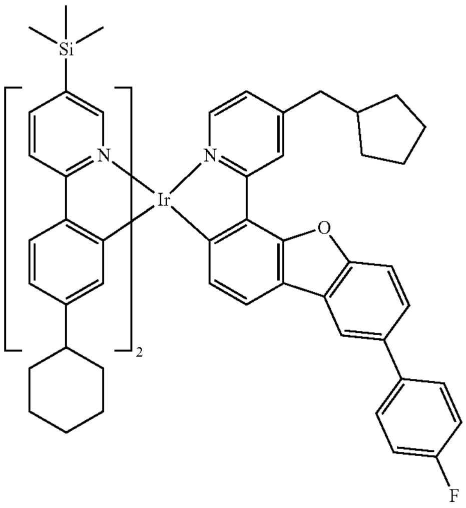
1489
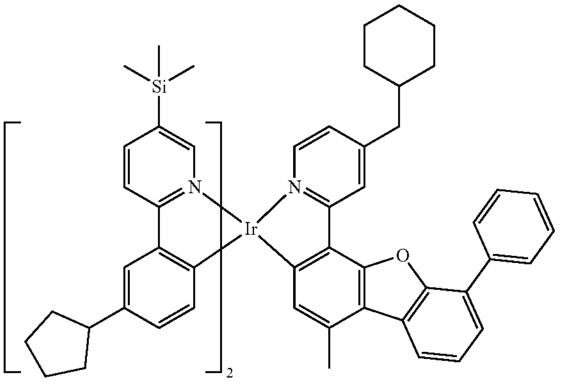
1490
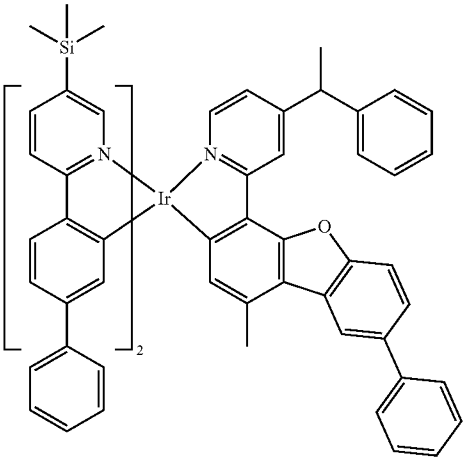

-continued
1491
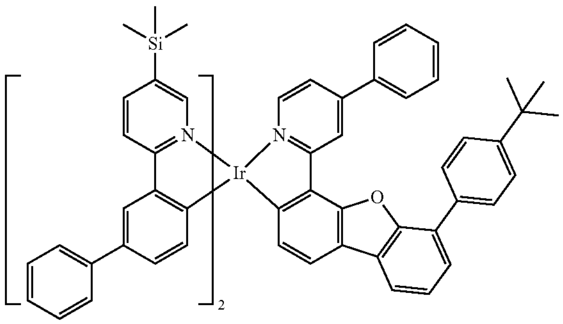
1492
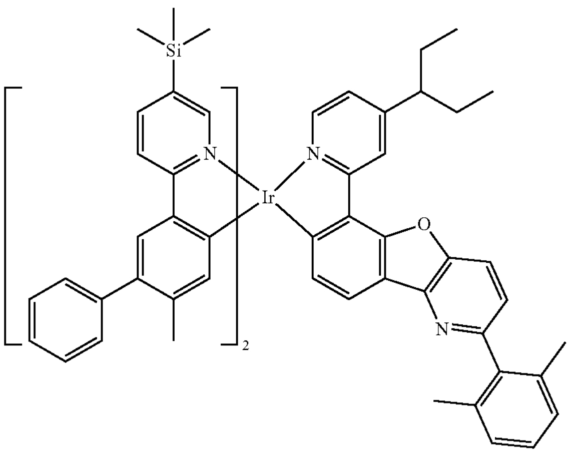
1493
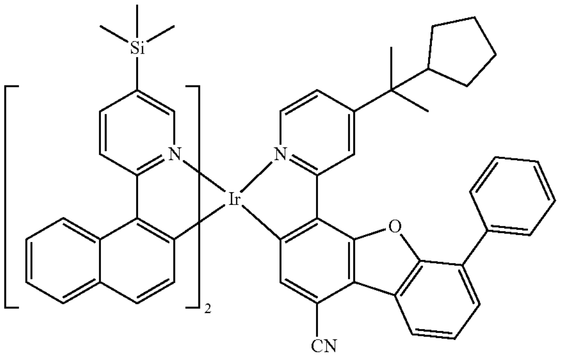
1494
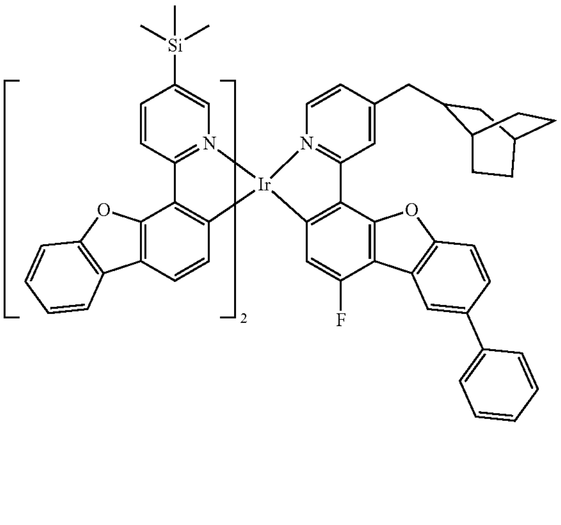
1495
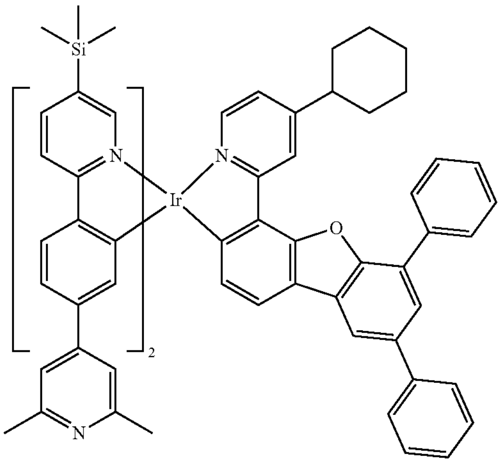
1496
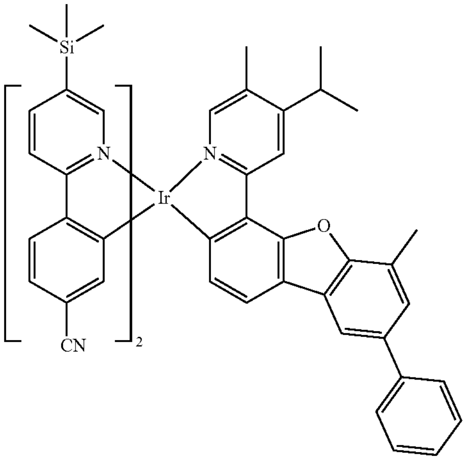
1497
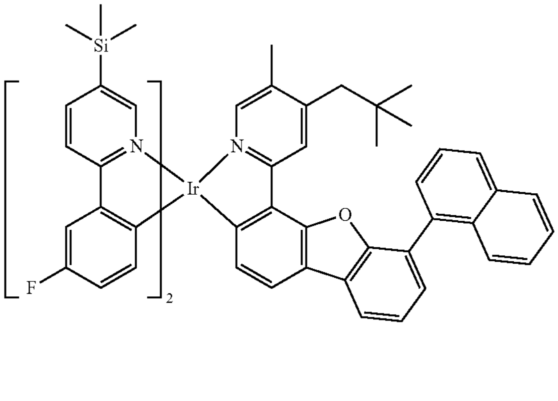

-continued
1498
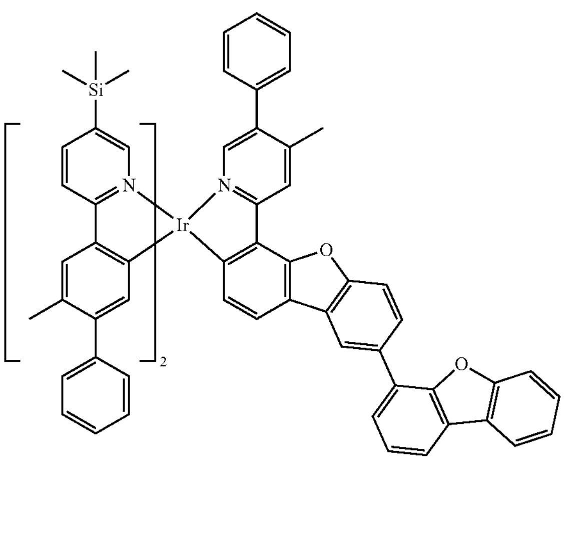
1499
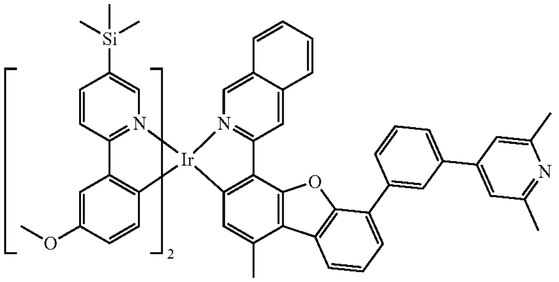
1500
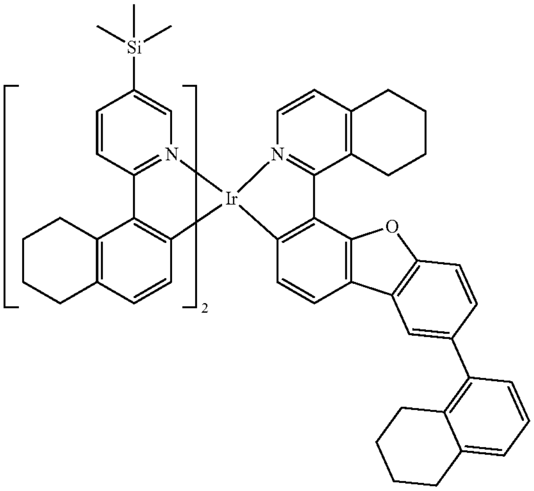
-continued
1501
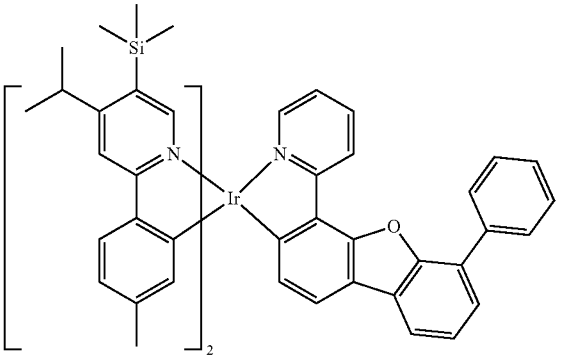
1502
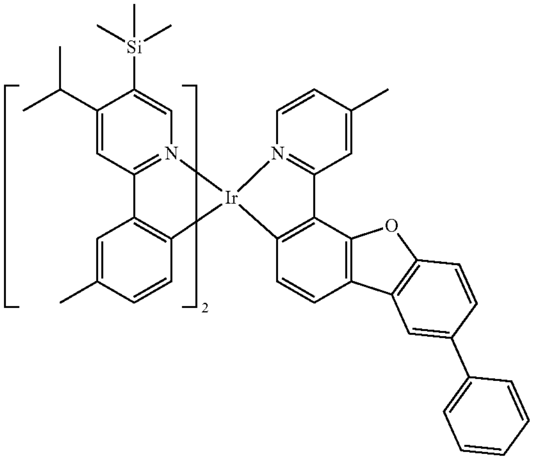
1503
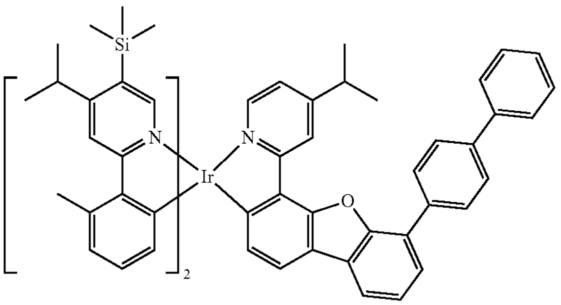

-continued
1504
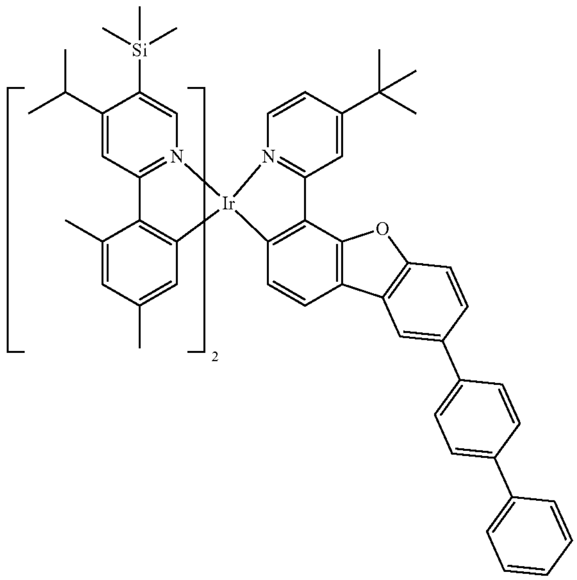
1505
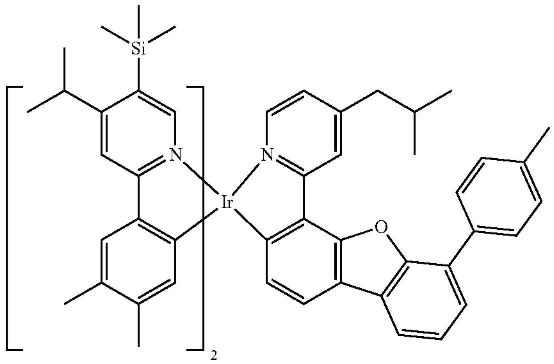
1506
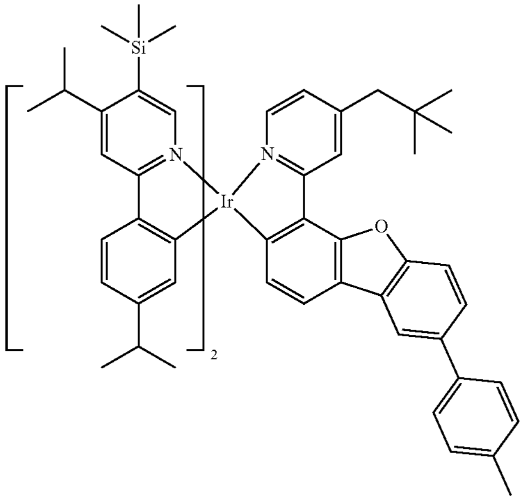
1507
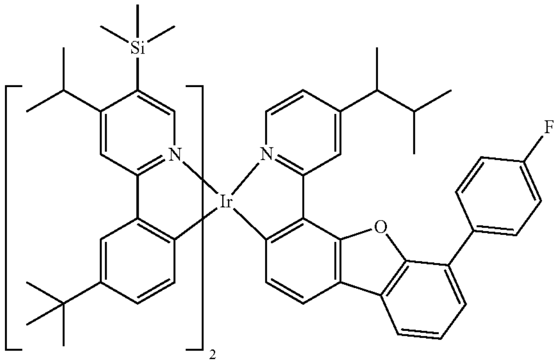
1508
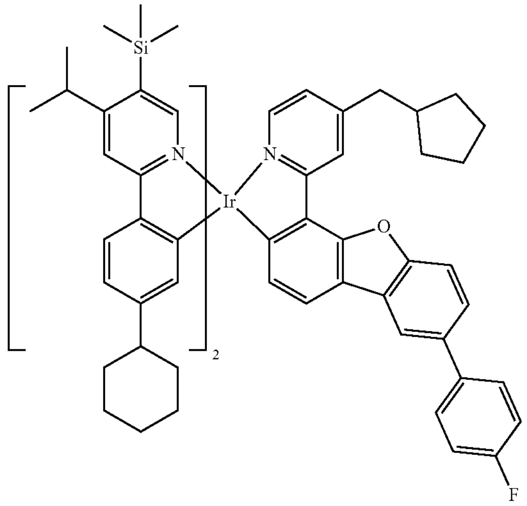
1509
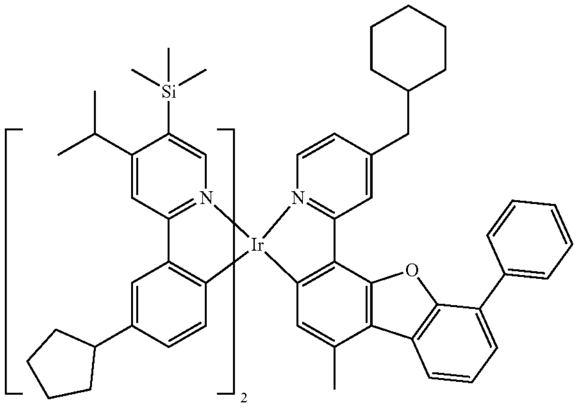

-continued
1510
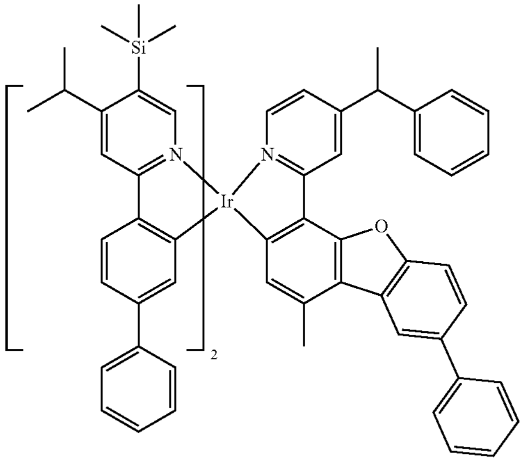
1511
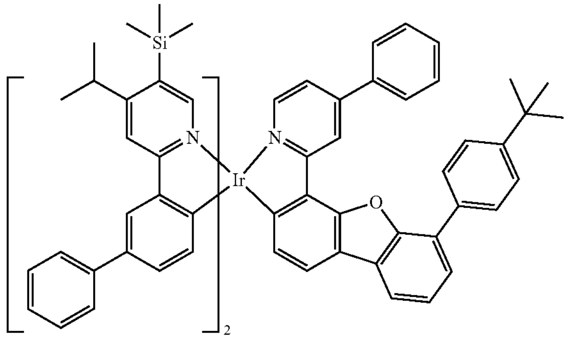
1512
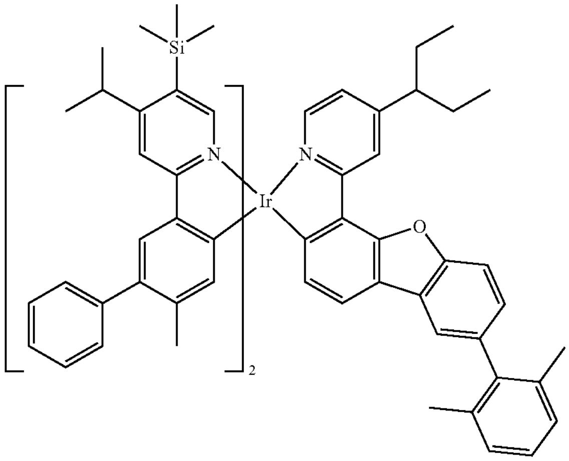
-continued
1513
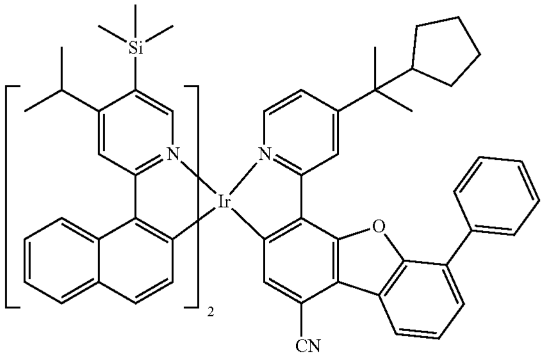
1514
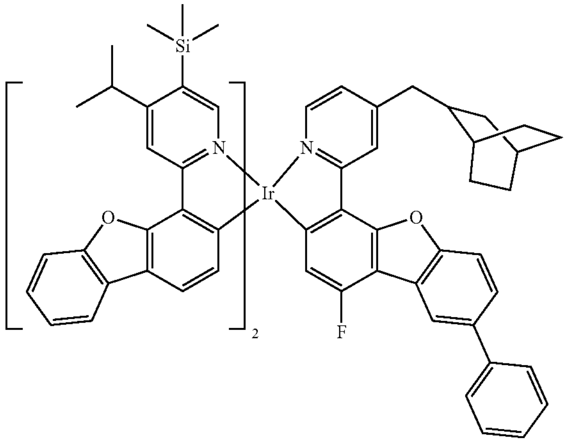
1515
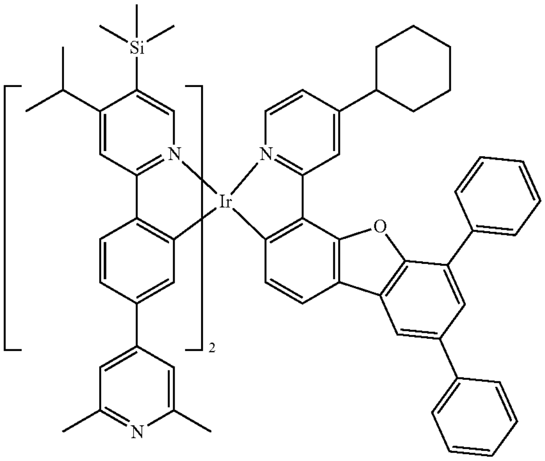

-continued
1516
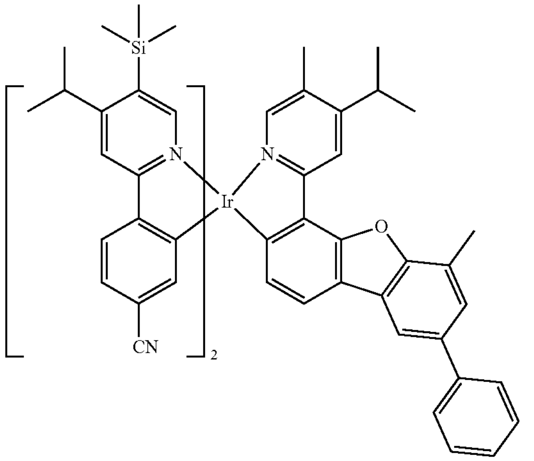
1517
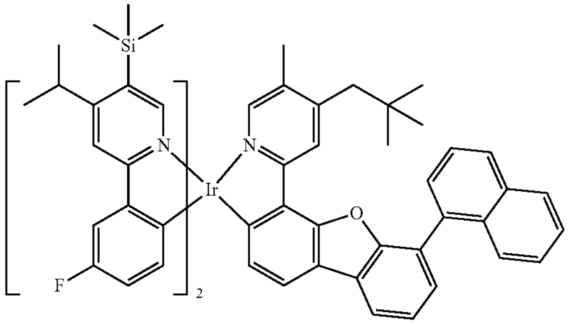
1518
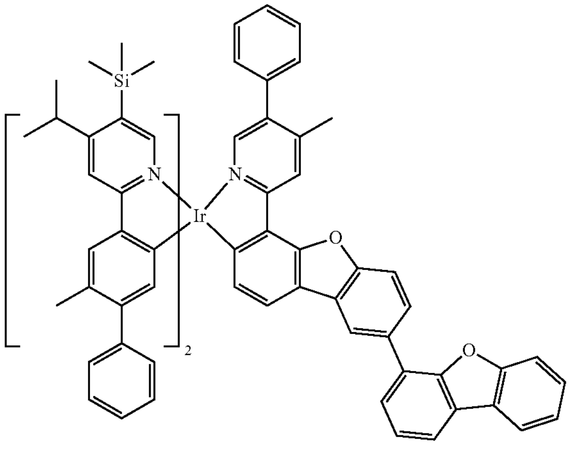
1519
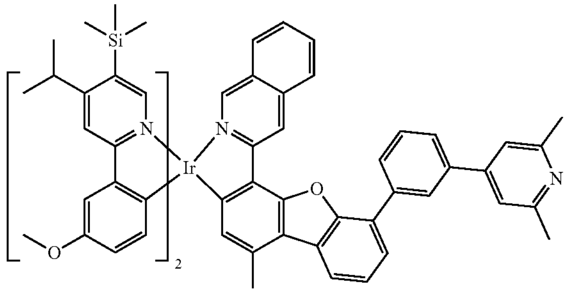
-continued
1520
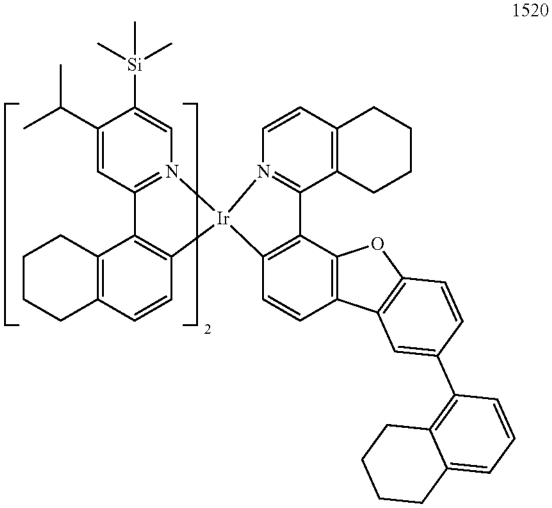
1521
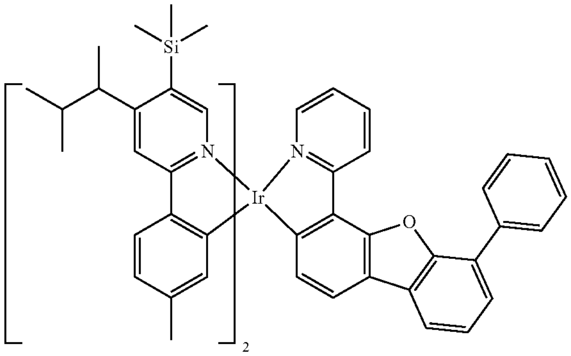
1522
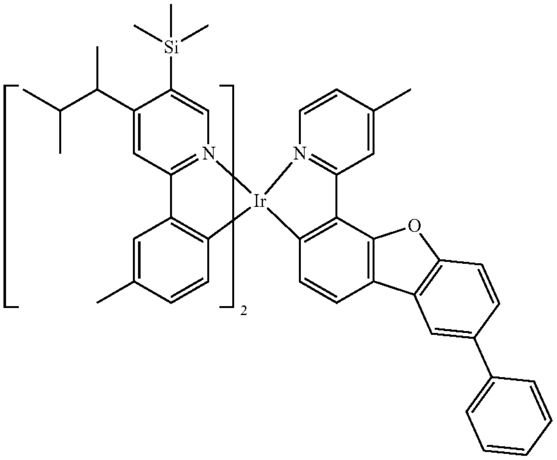

-continued
1523
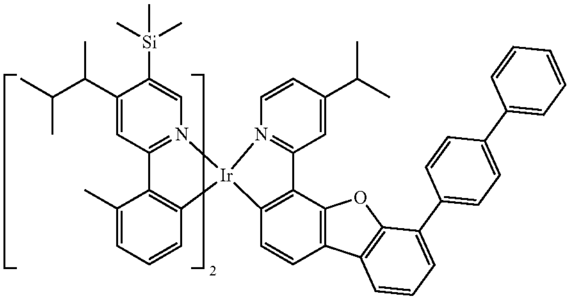
1524
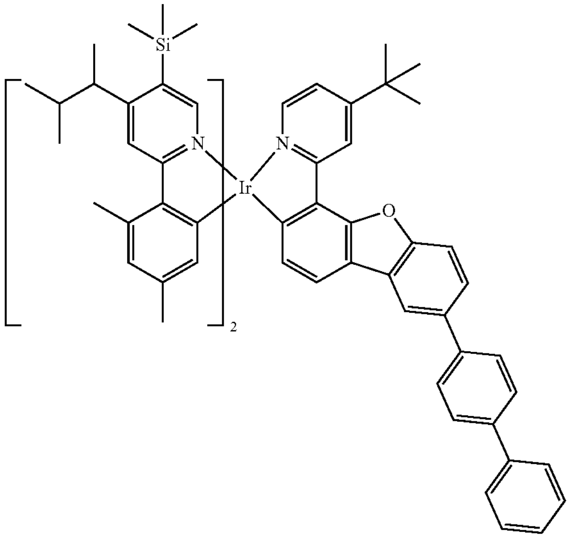
1525
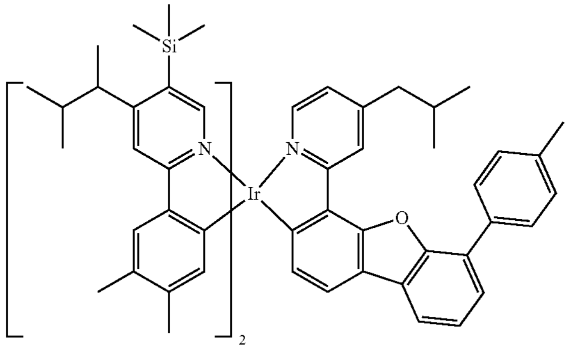
-continued
1526
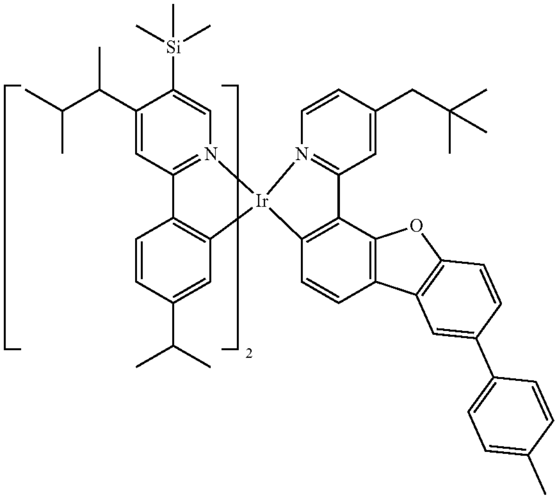
1527
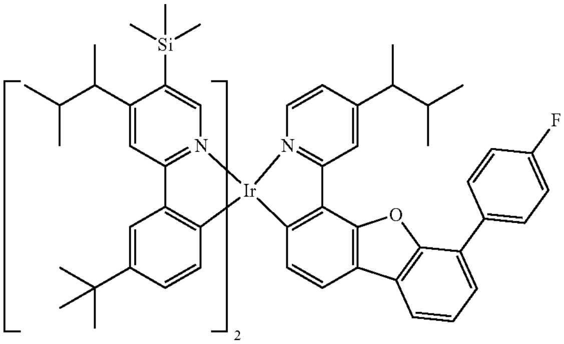
1528
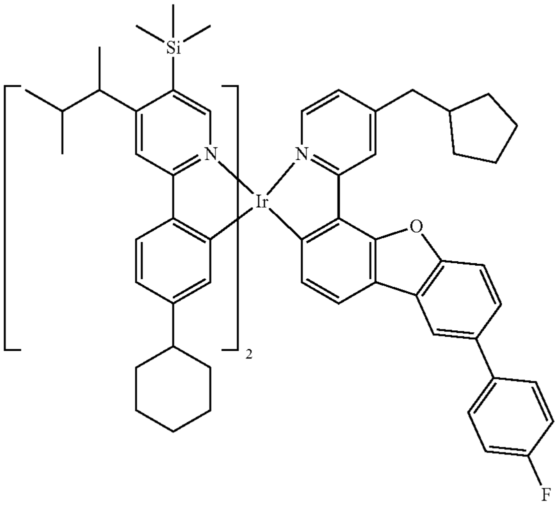

-continued
1529
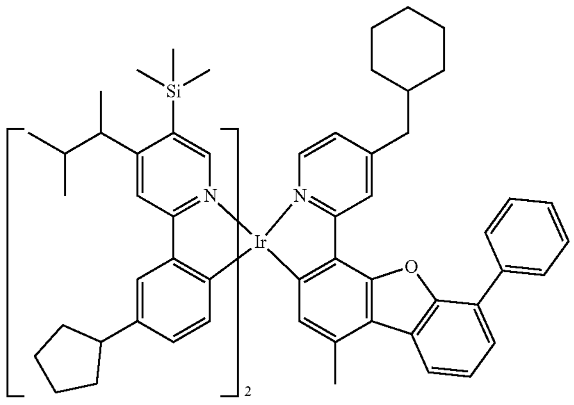
1530
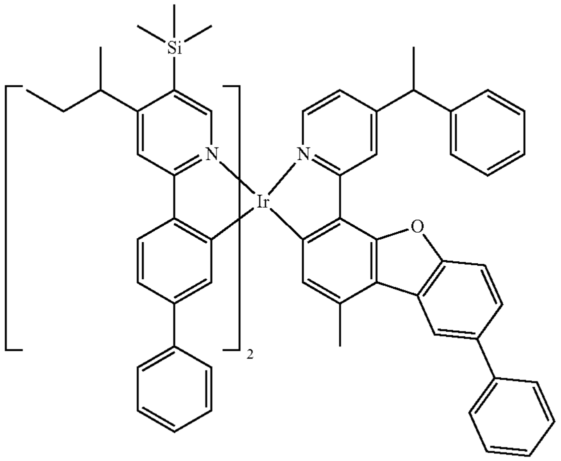
1531
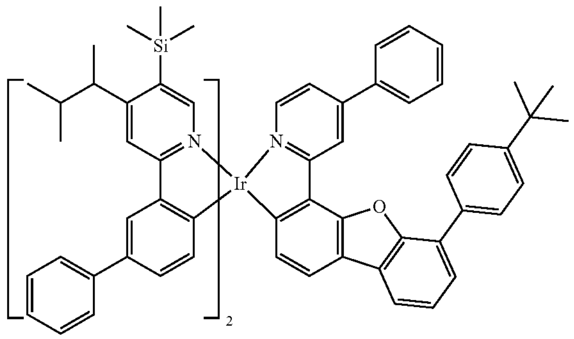
-continued
1532
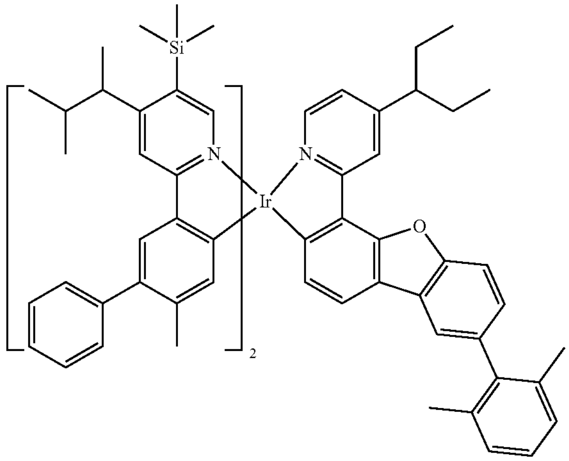
1533
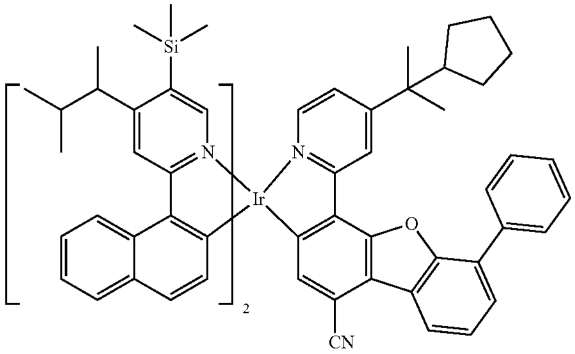
1534
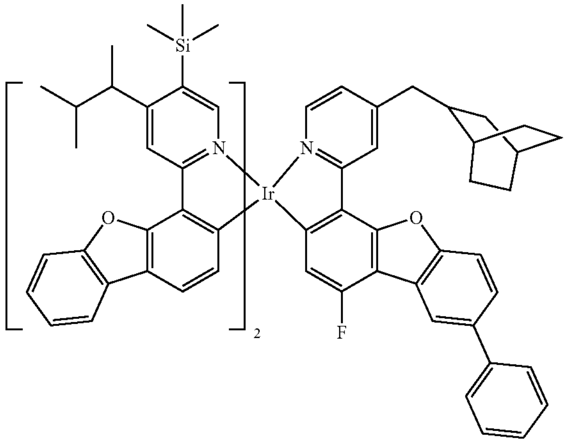

-continued
1535
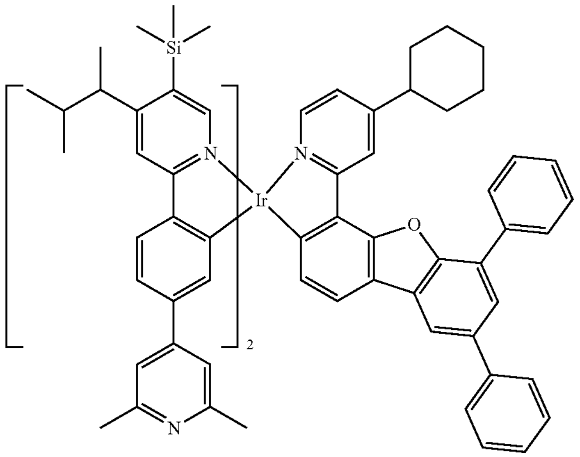
1536
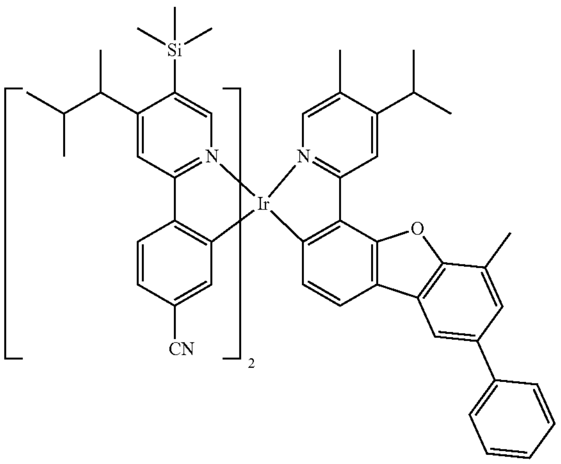
1537
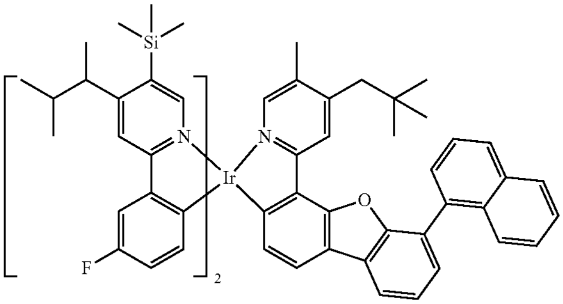
-continued
1538
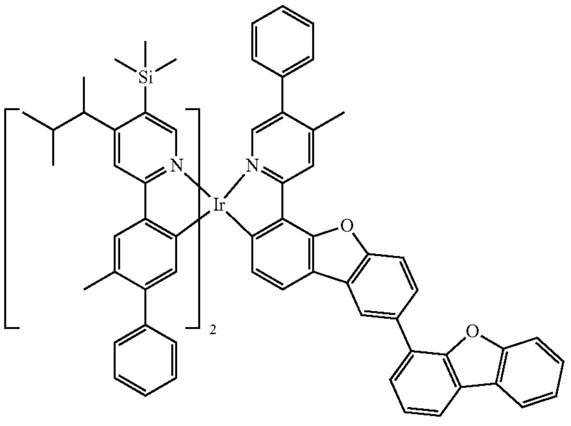
1539
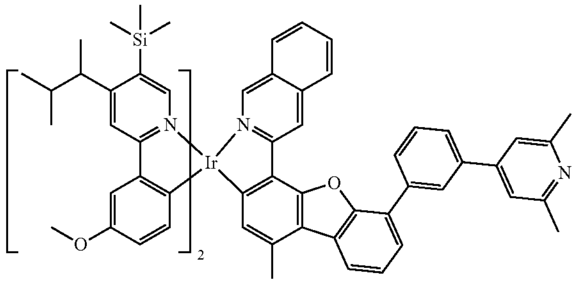
1540
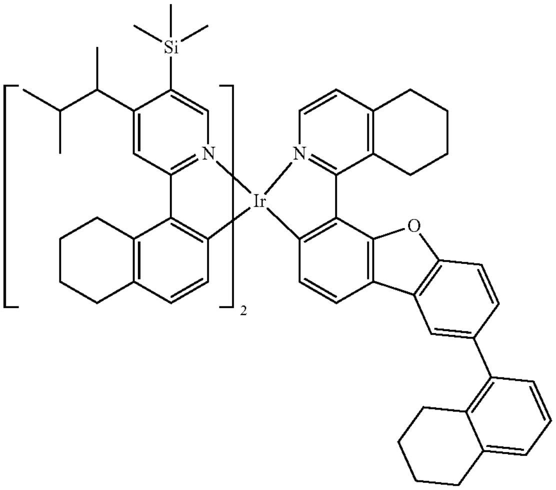

-continued
1541
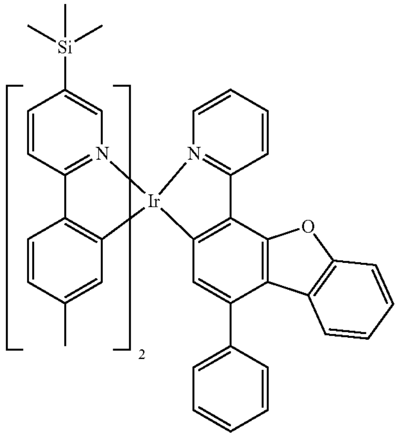
1542
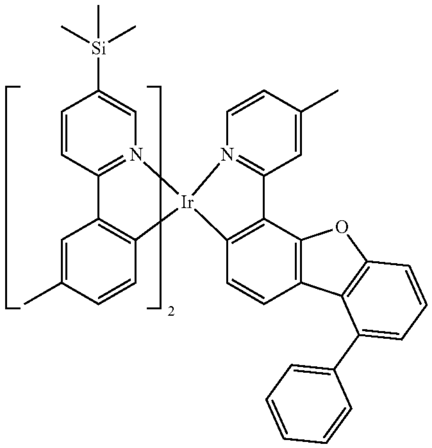
1543
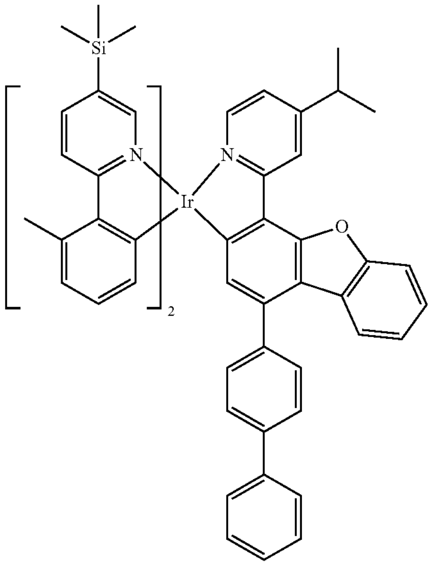
-continued
1544
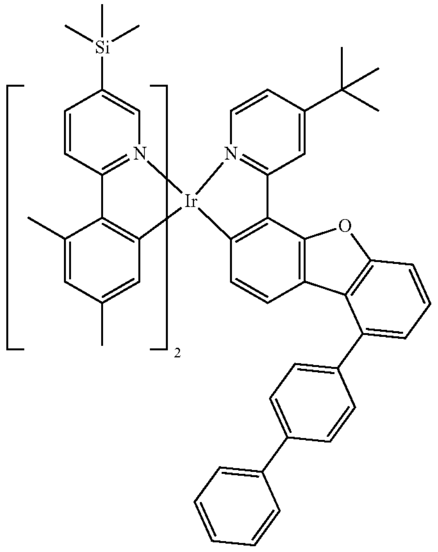
1545
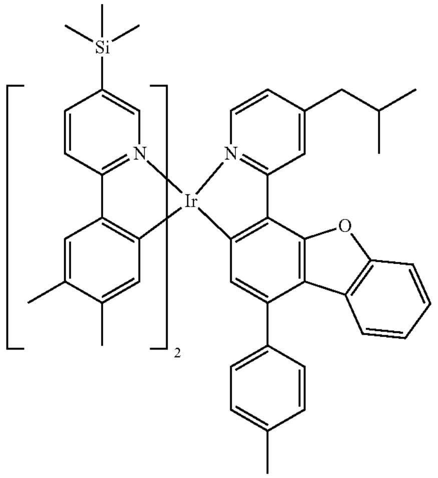
1546
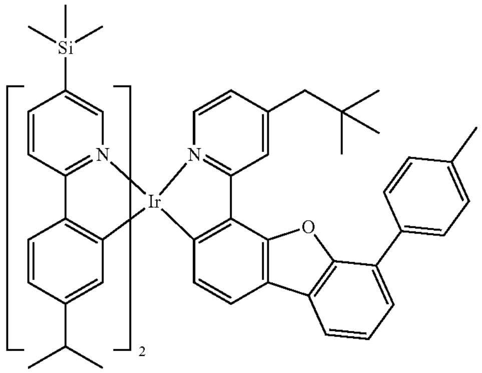

-continued
1547
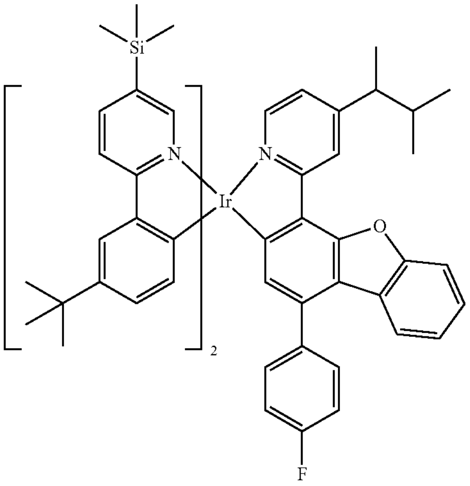
1548
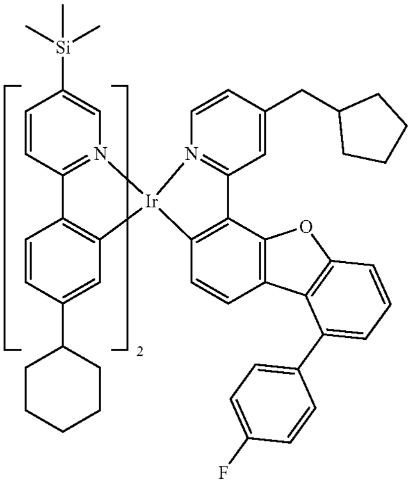
1549
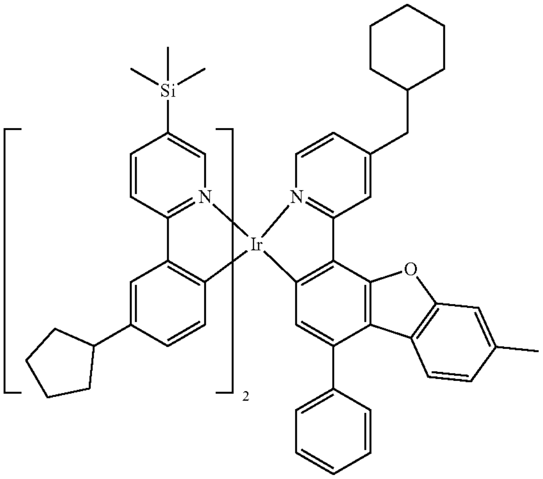
-continued
1550
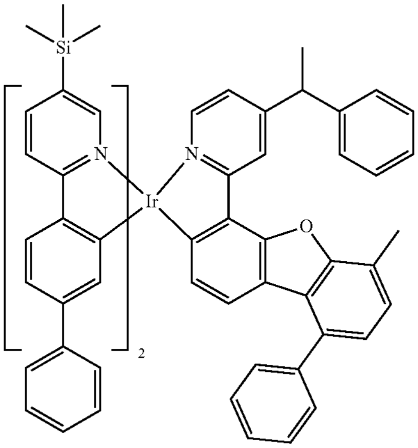
1551
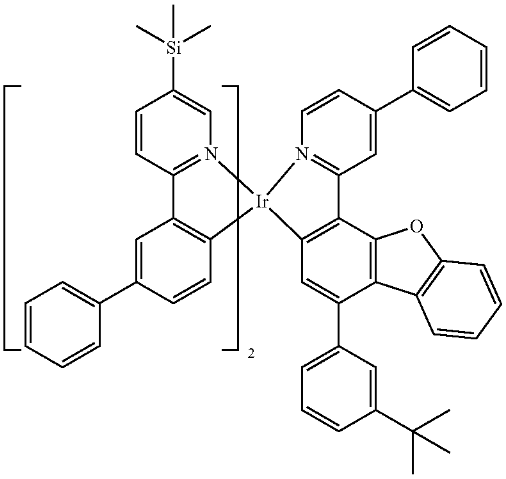
1552
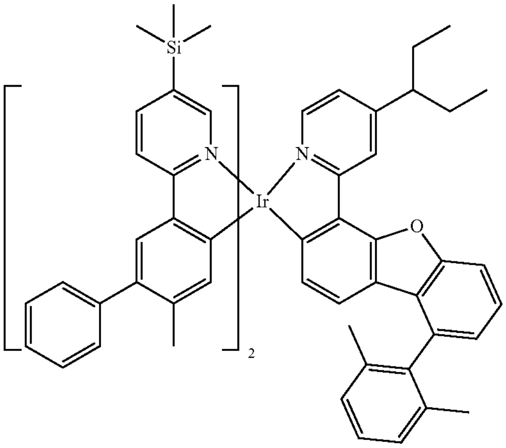

-continued
1553
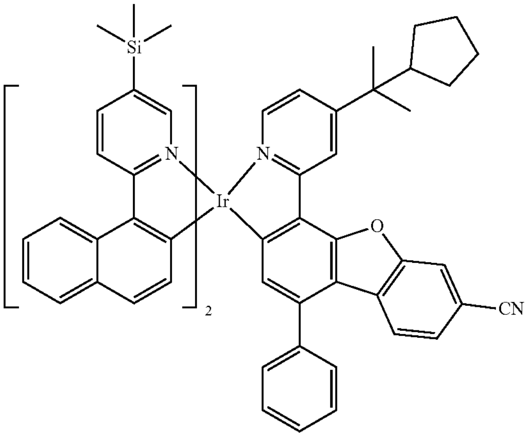
1554
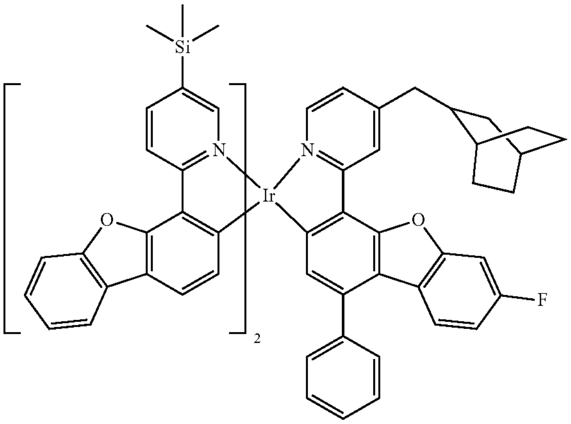
1555
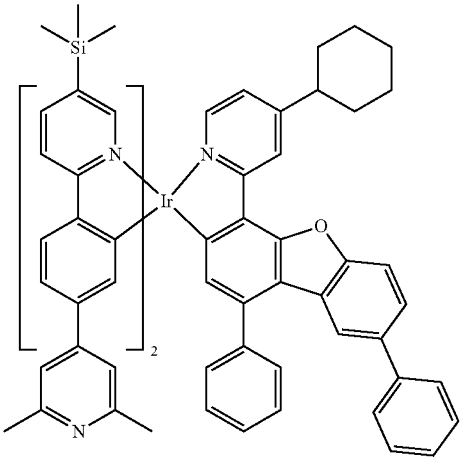
-continued
1556
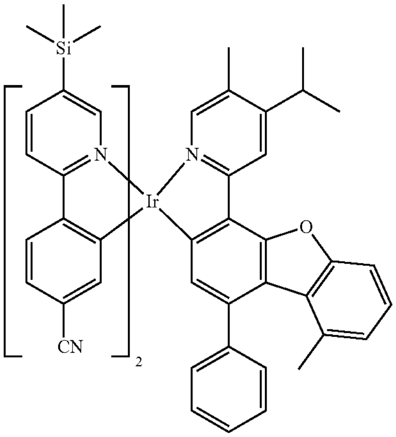
1557
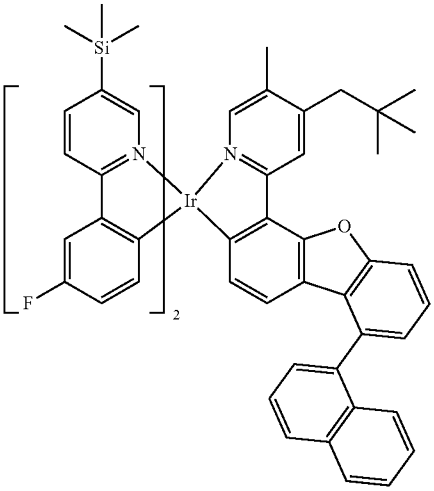
1558
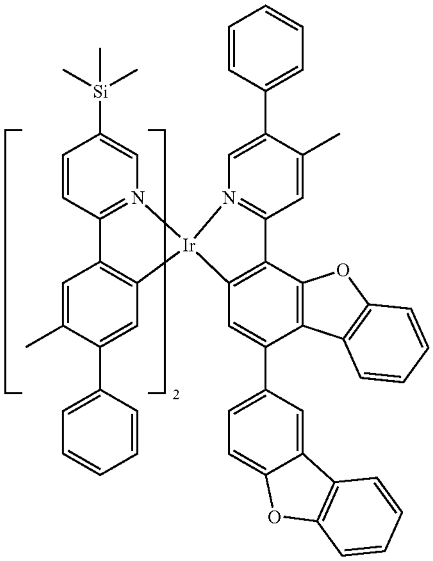

-continued
1559
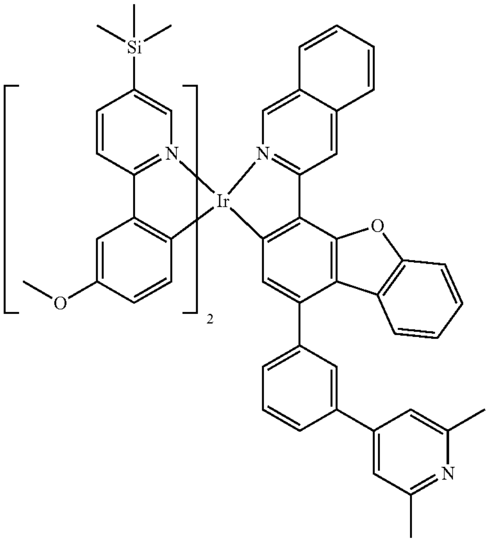
1560
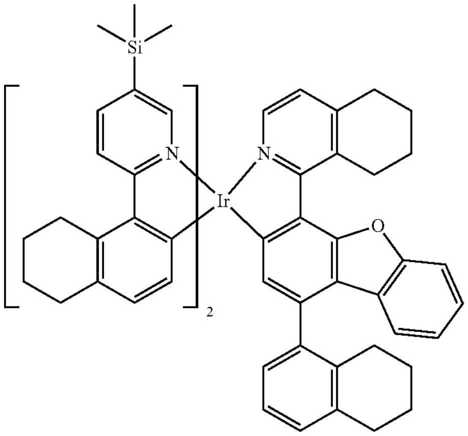
1561
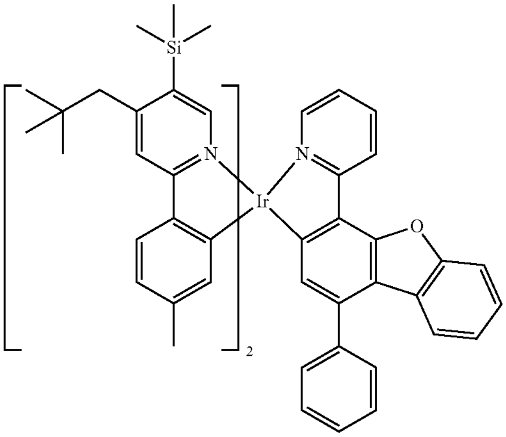
-continued
1562
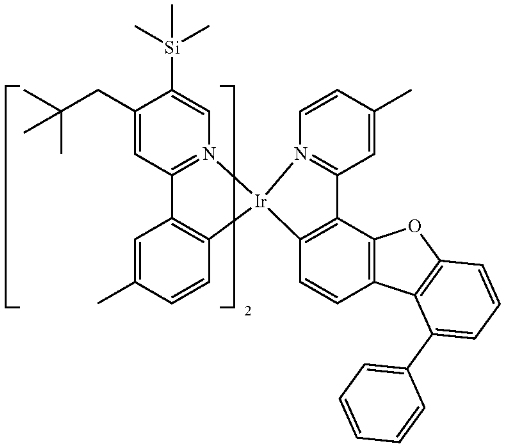
1563
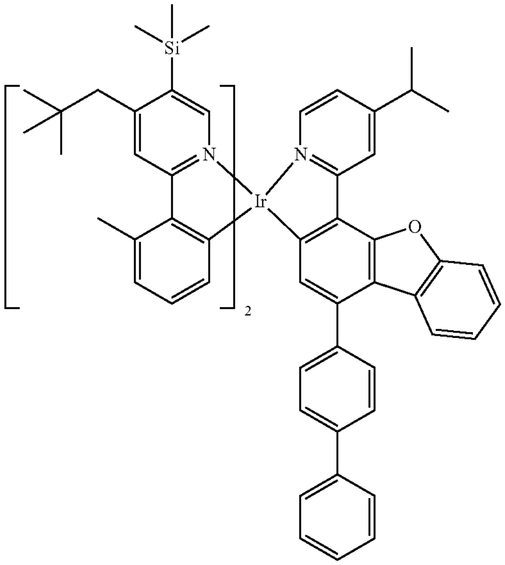
1564
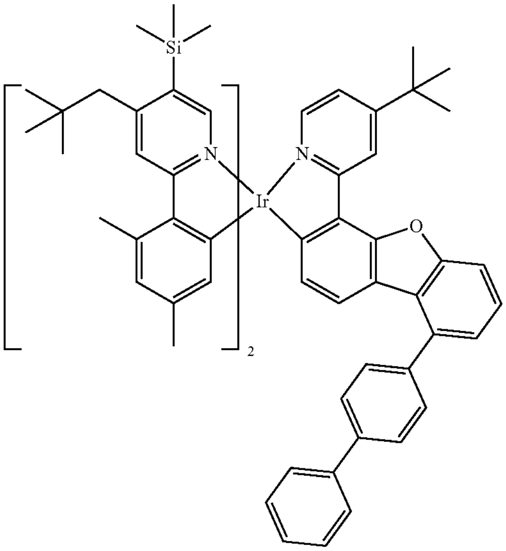

-continued
1565
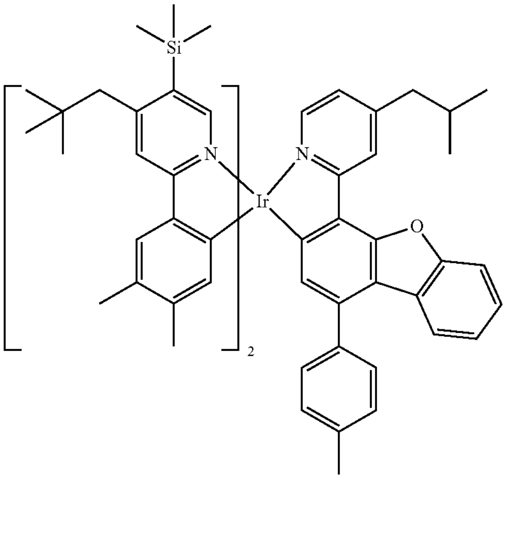
1566
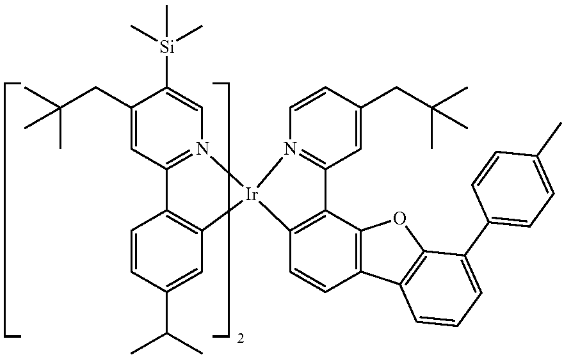
1567
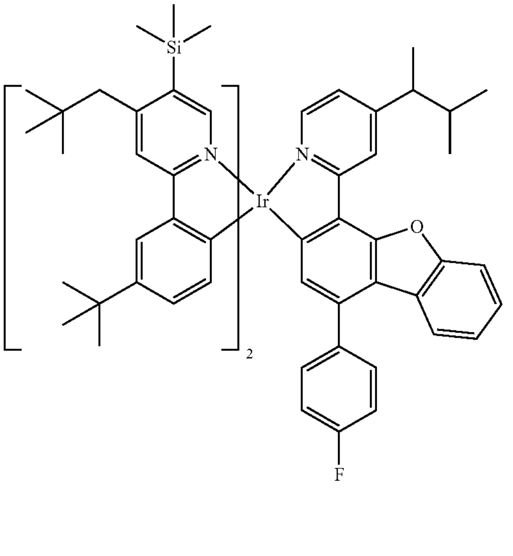
-continued
1568
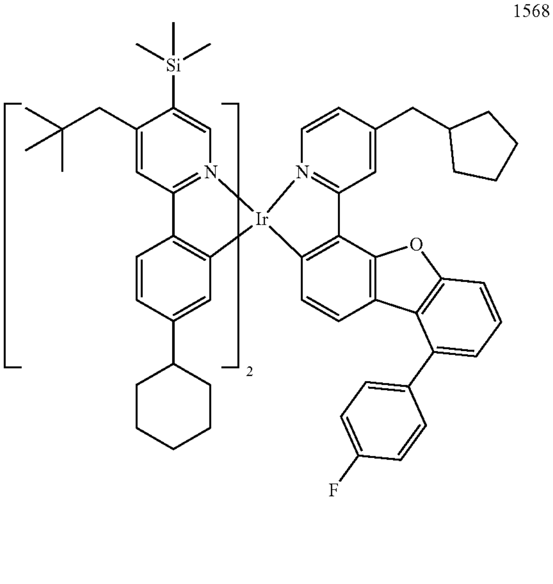
1569
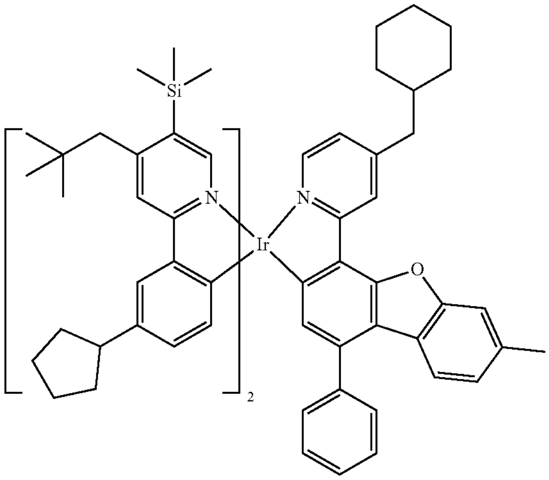
1570
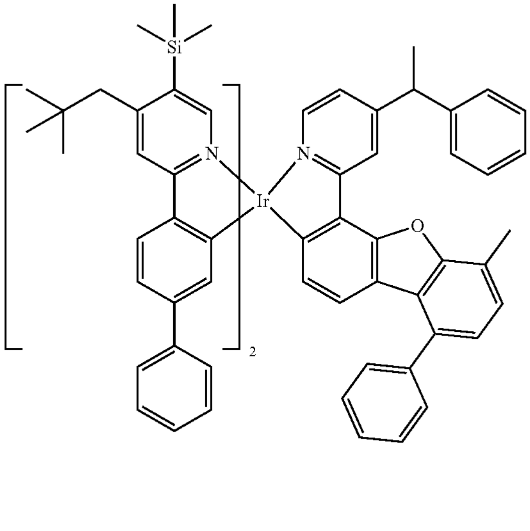

-continued
1571
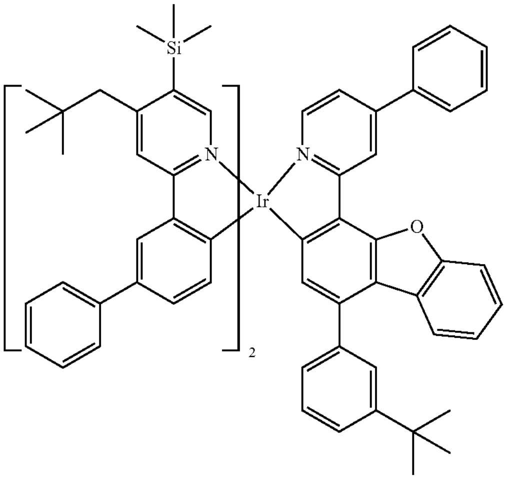
1572
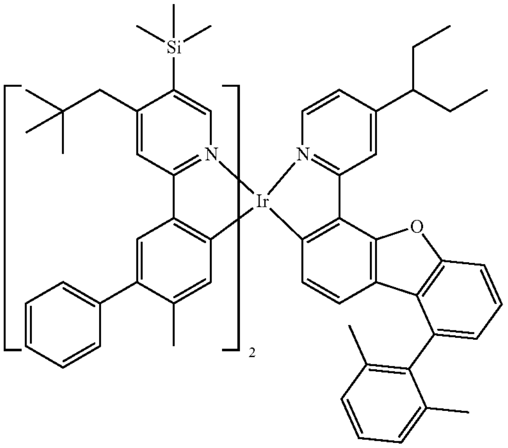
1573
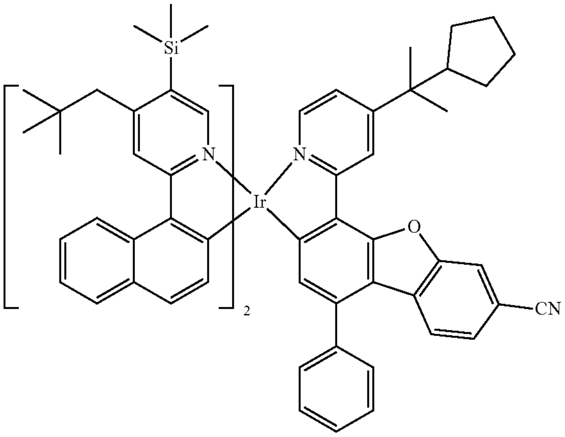
-continued
1574
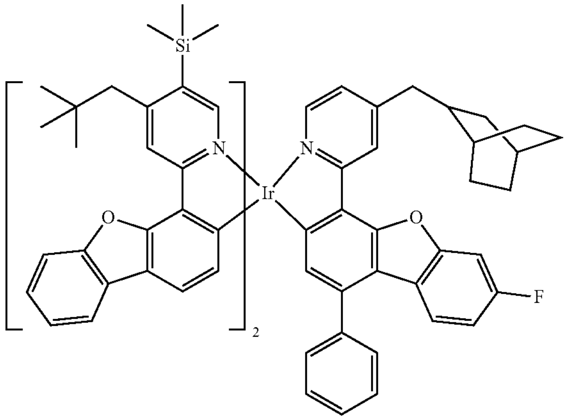
1575
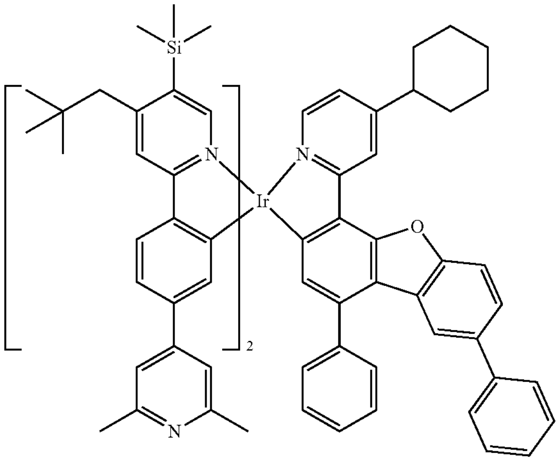
1576
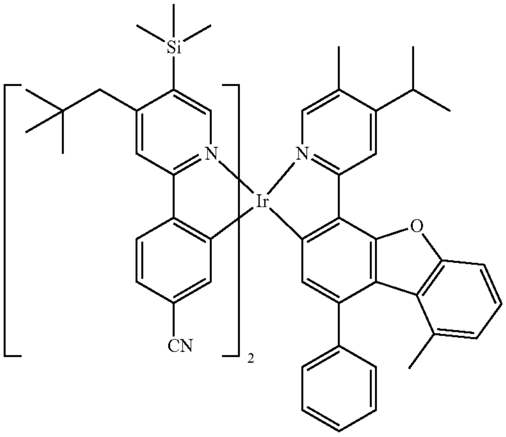

-continued
1577
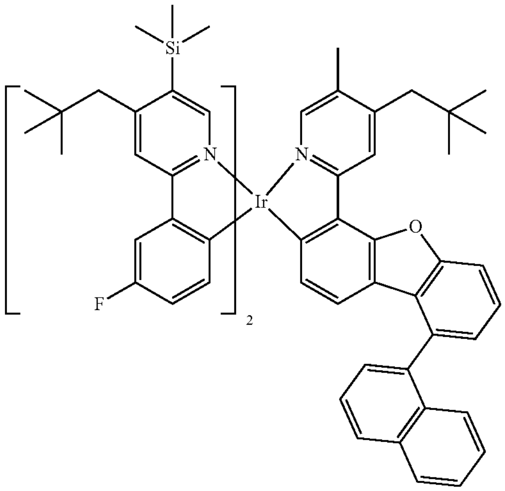
1578
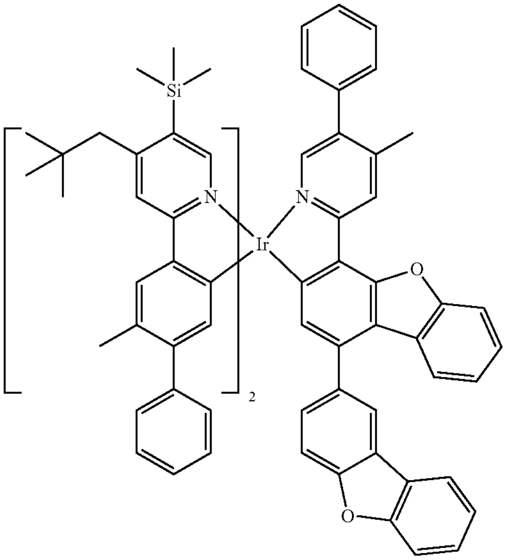
1579
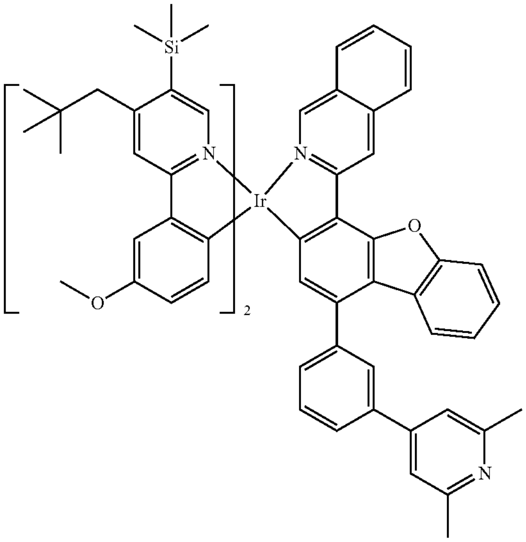
-continued
1580
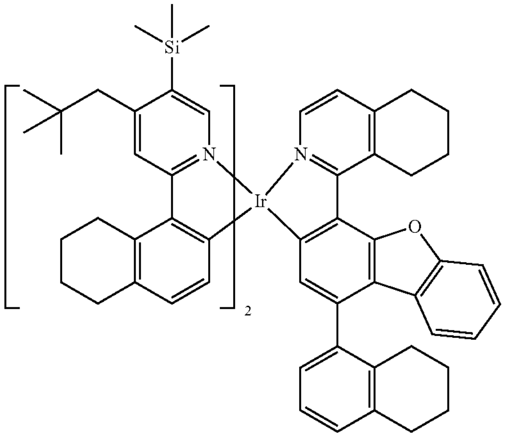
1581
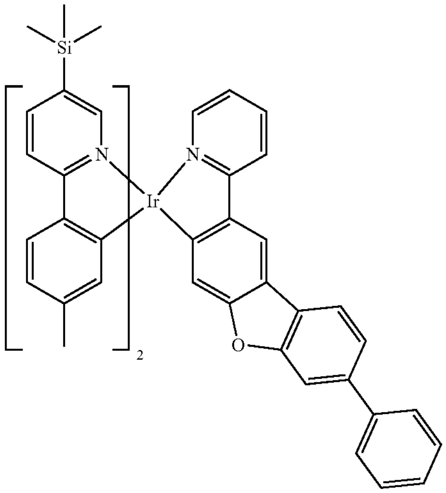
1582
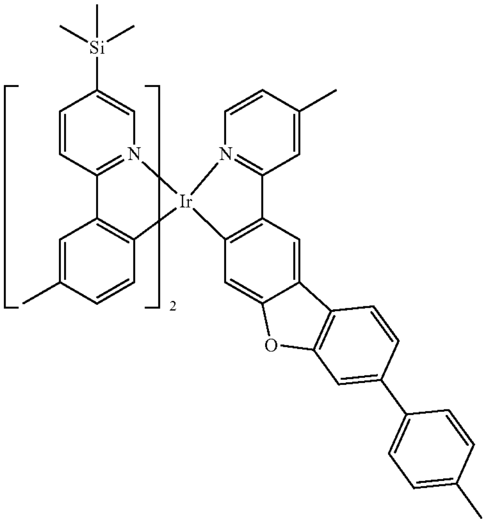

1583
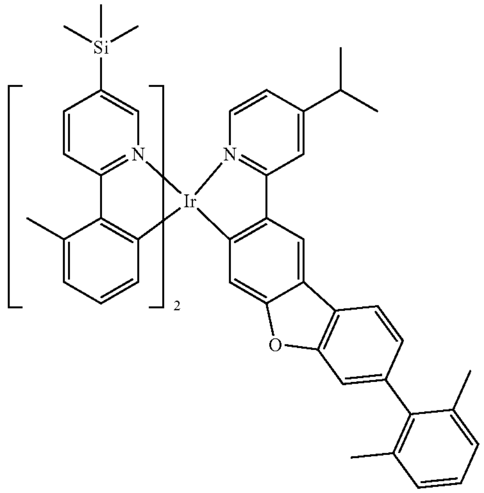
1584
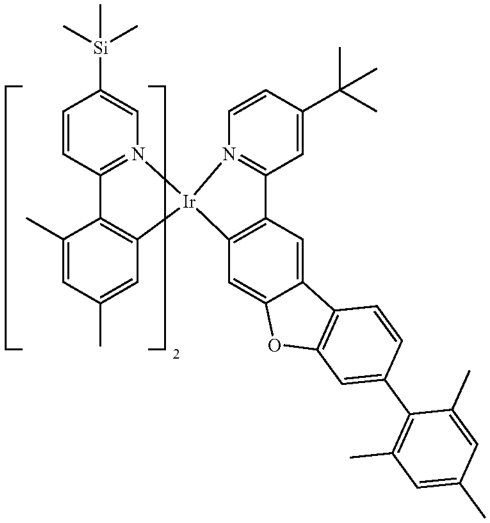
1585
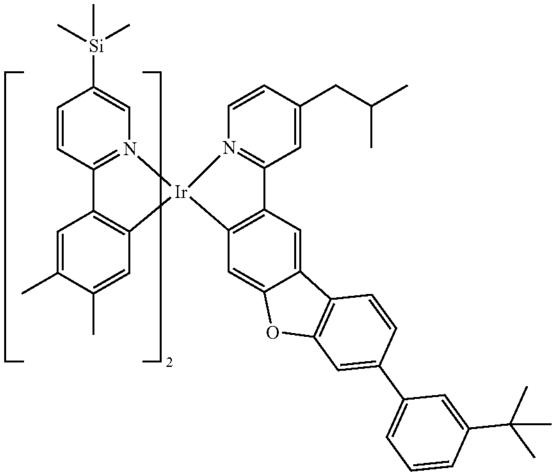
-continued
1586
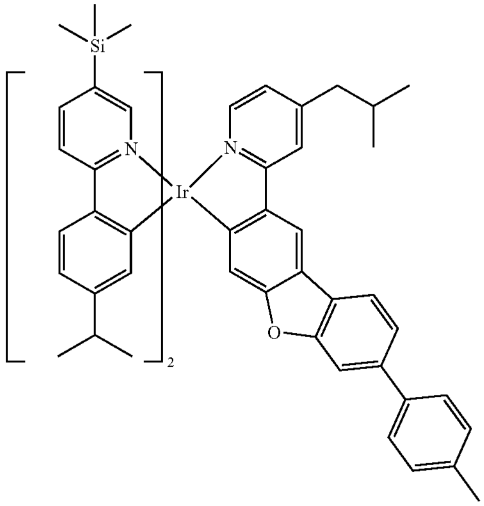
1587
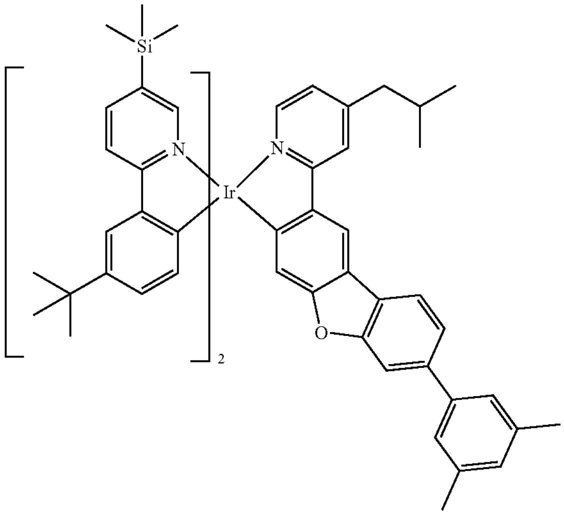
1588
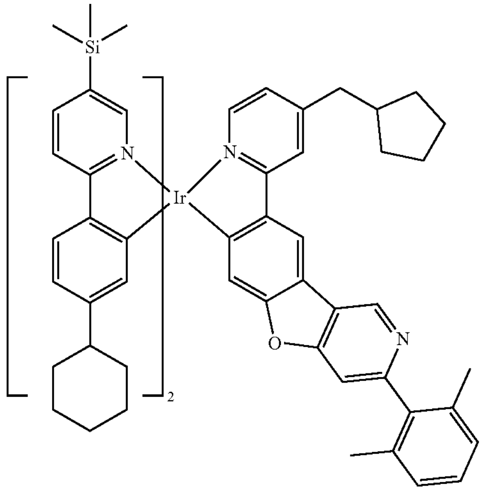

-continued
1589
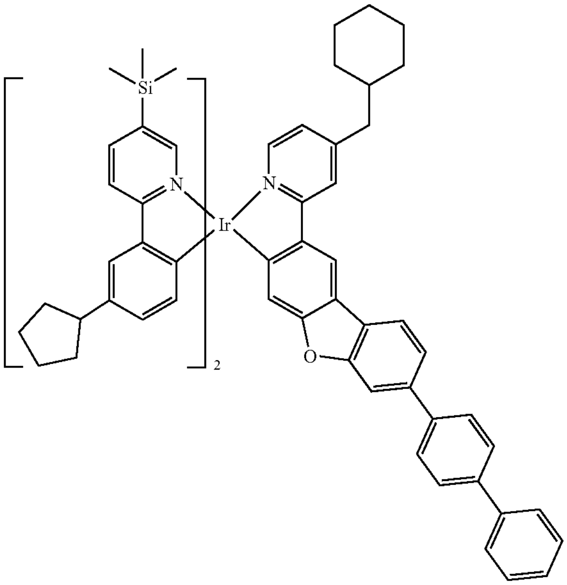
1590
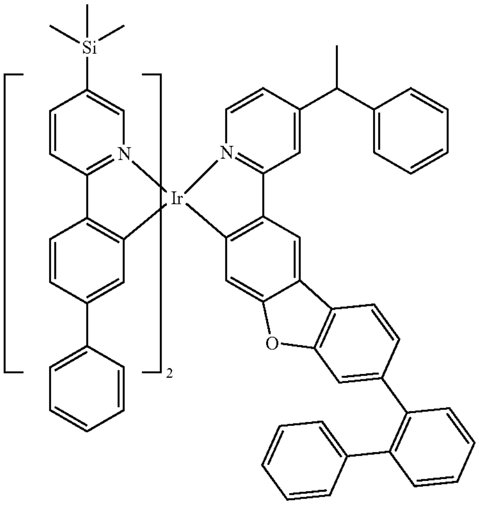
1591
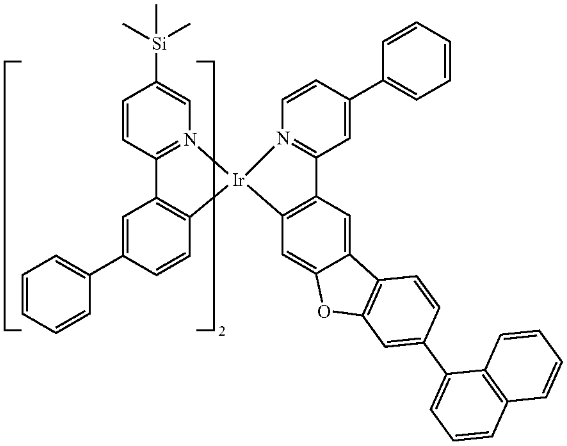
-continued
1592
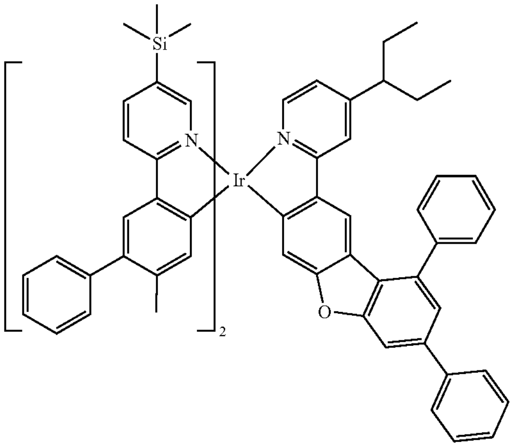
1593
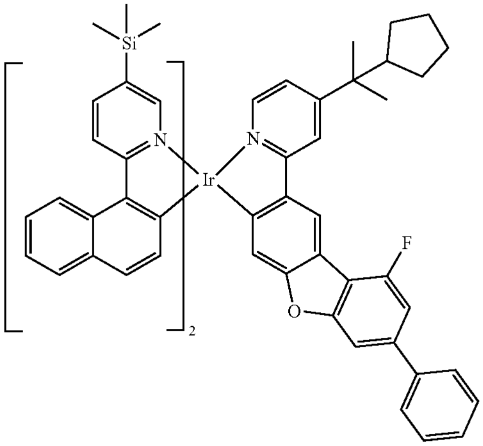
1594
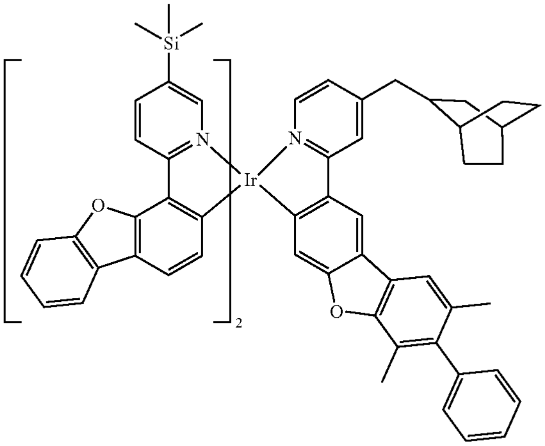

-continued
1595
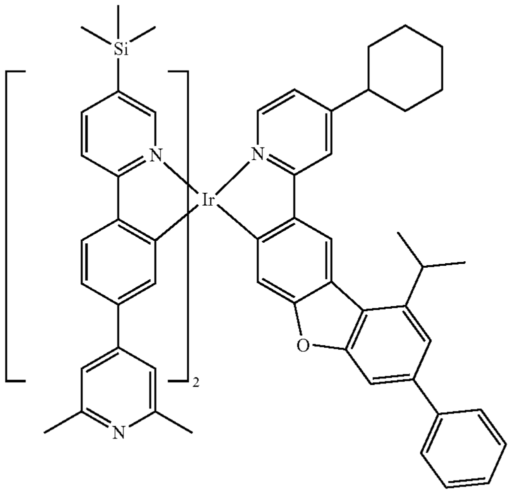
1596
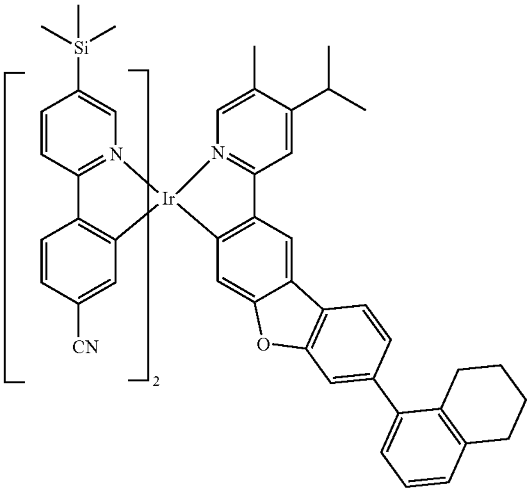
1597
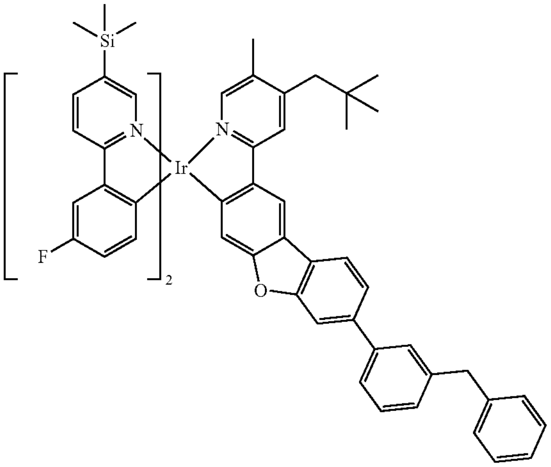
-continued
1598
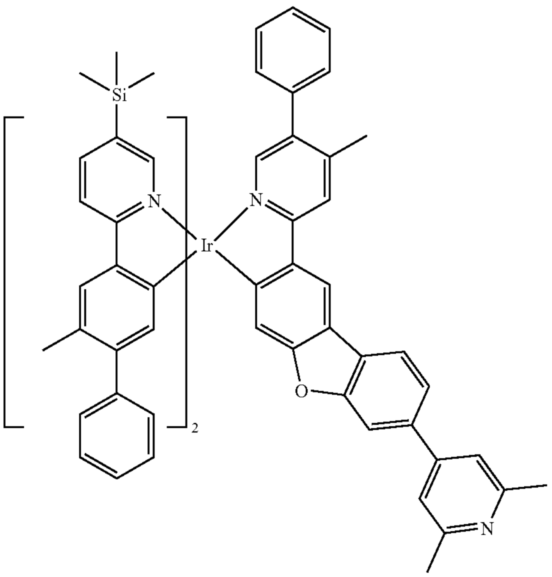
1599
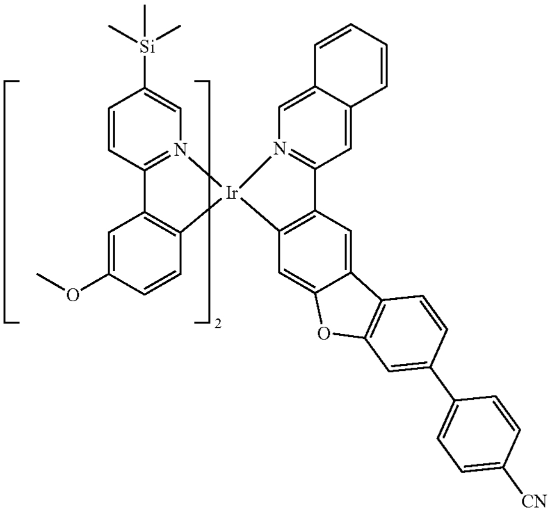
1600
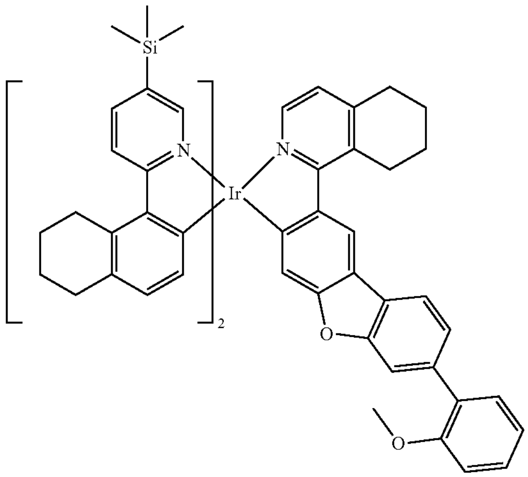

-continued
1601
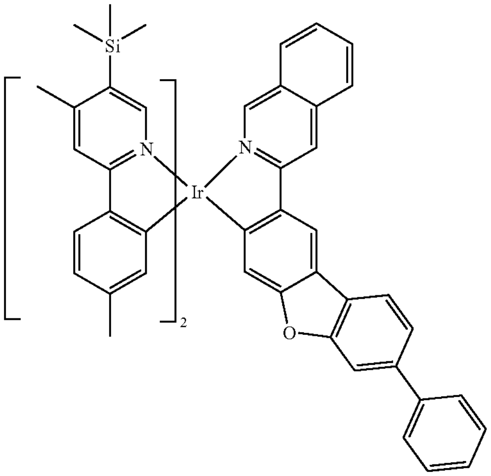
1602
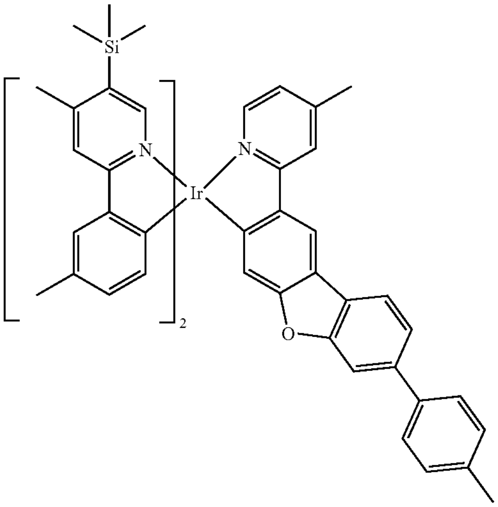
1603
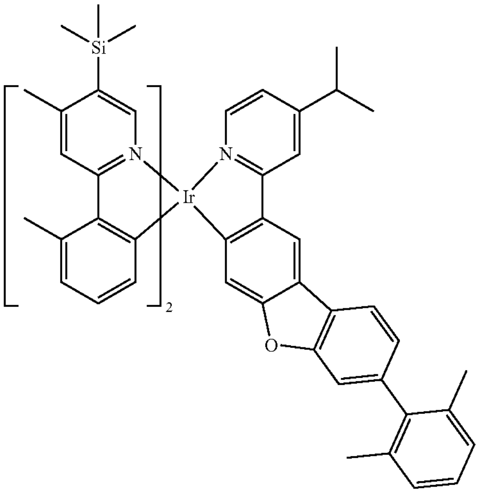
-continued
1604
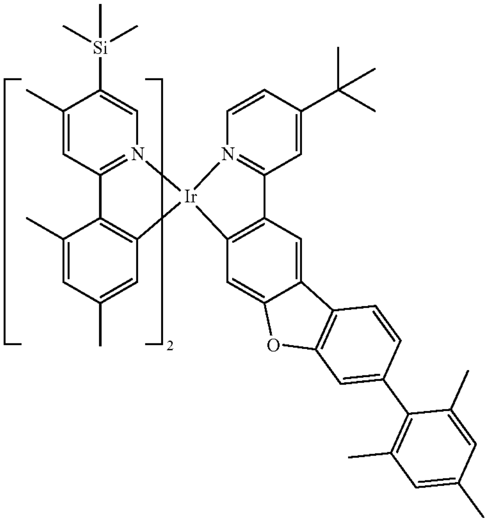
1605
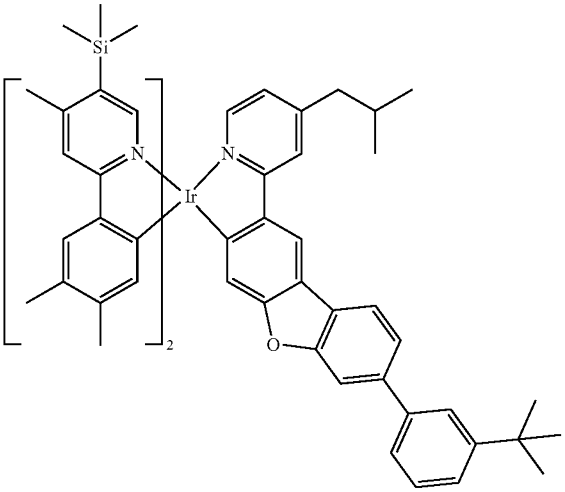
1606
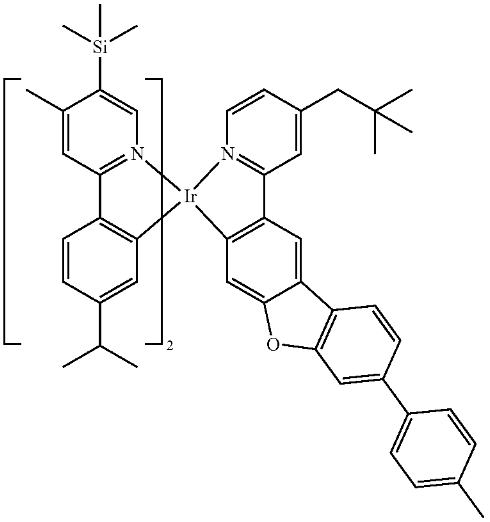

-continued
1607
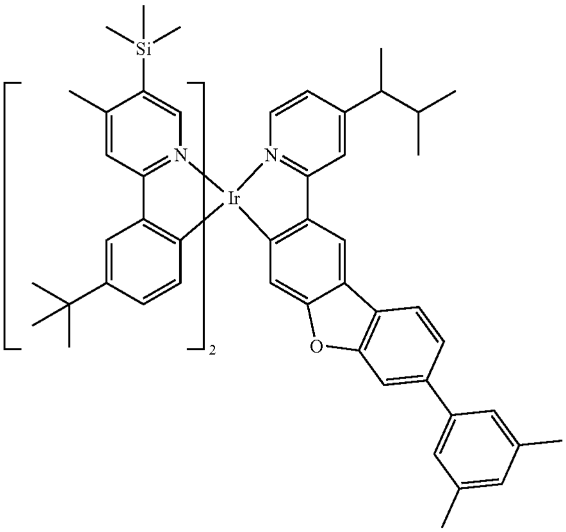
1608
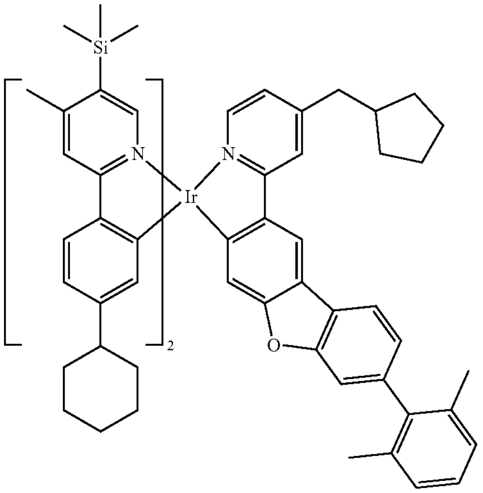
1609
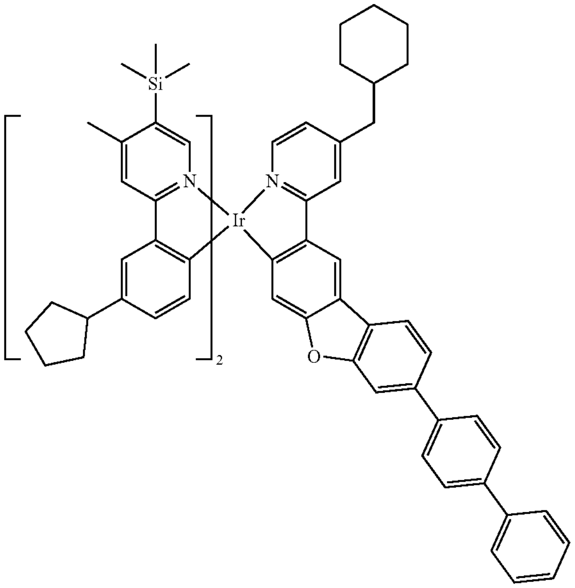
-continued
1610
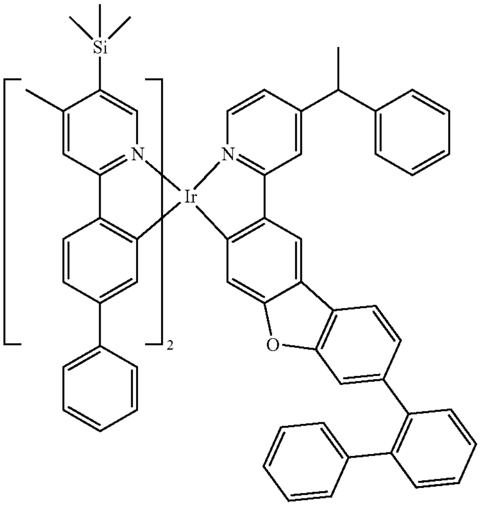
1611
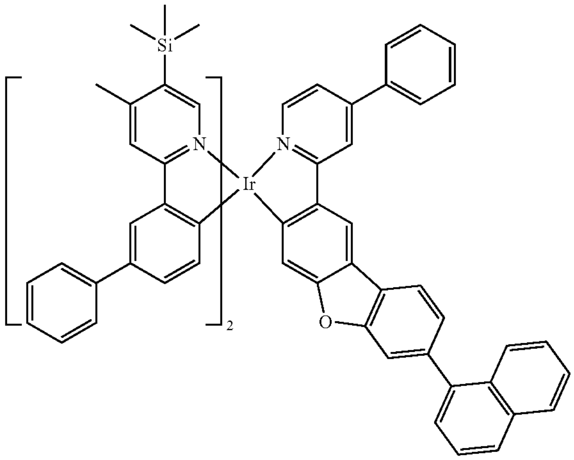
1612
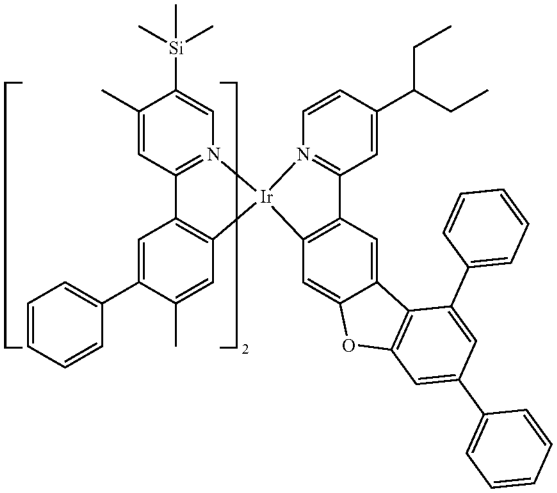

-continued
1613
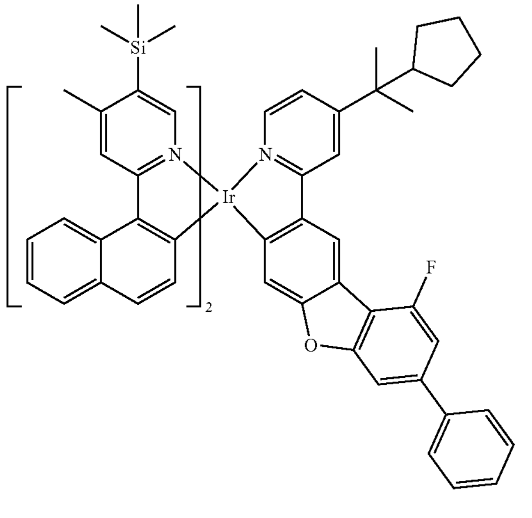
1614
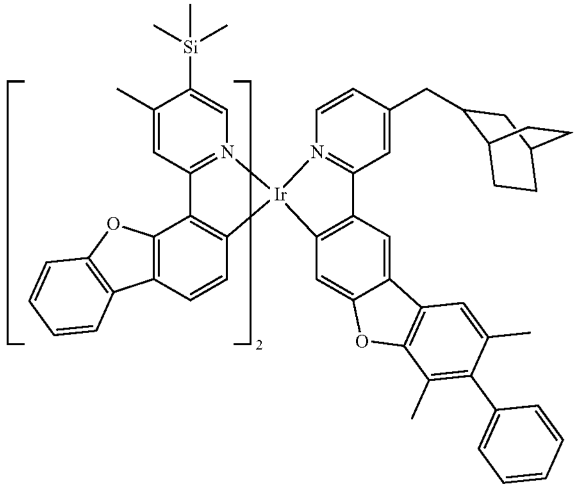
1615
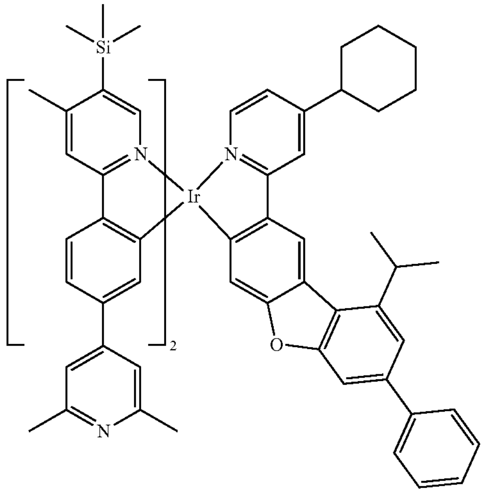
-continued
1616
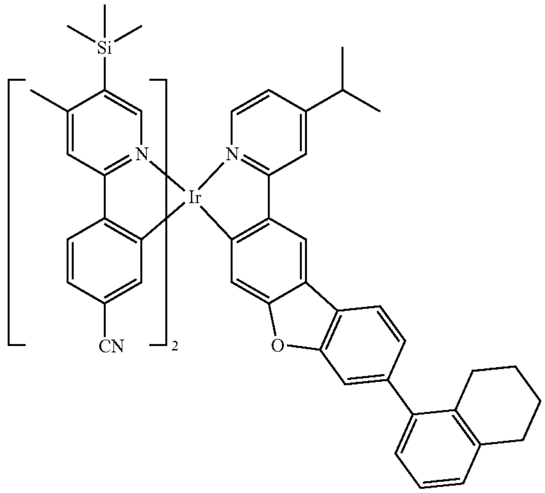
1617
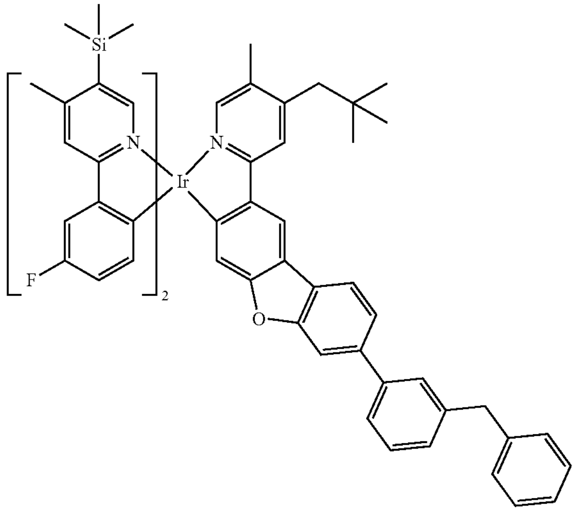
1618
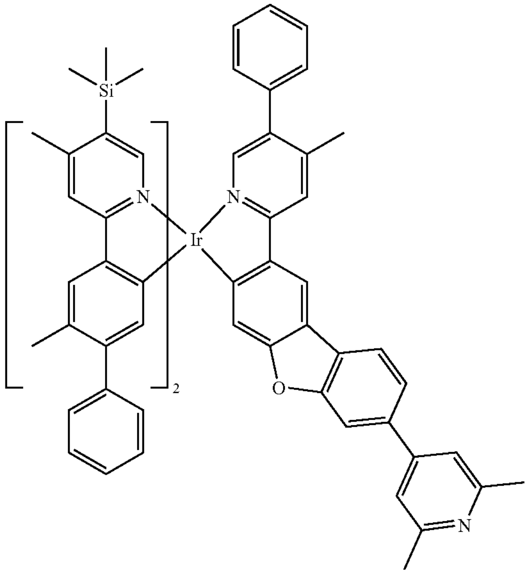

-continued
1619
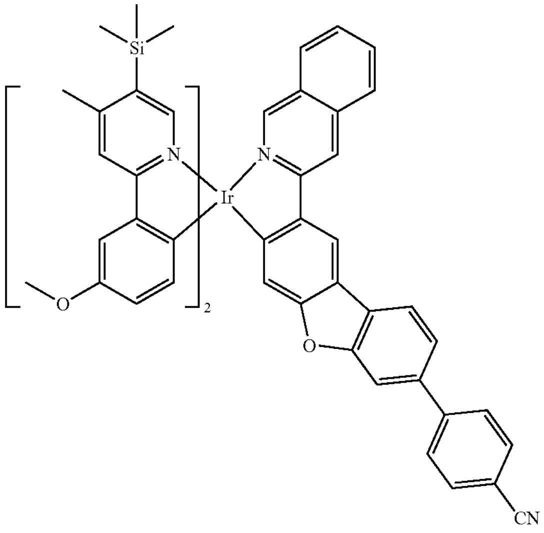
1620
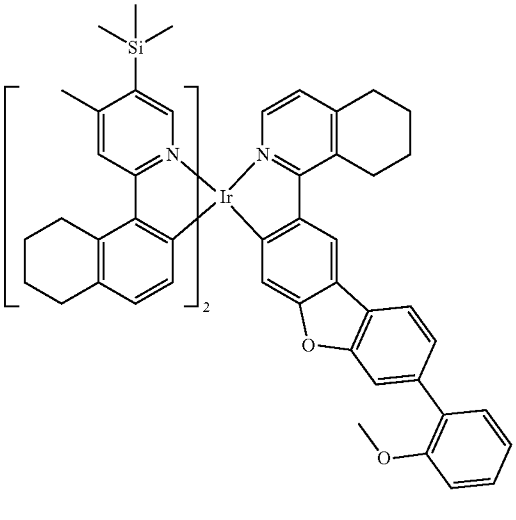
1621
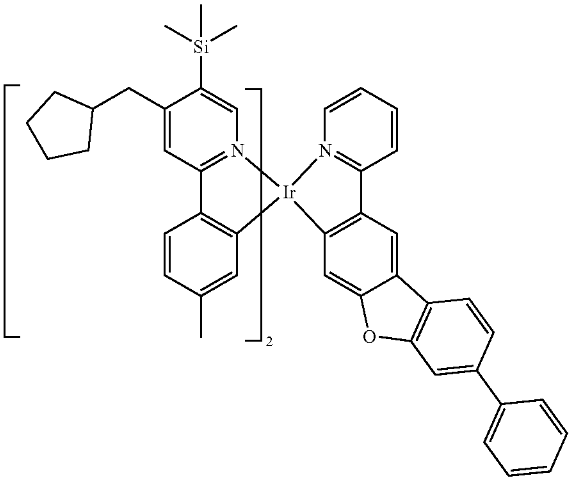
-continued
1622
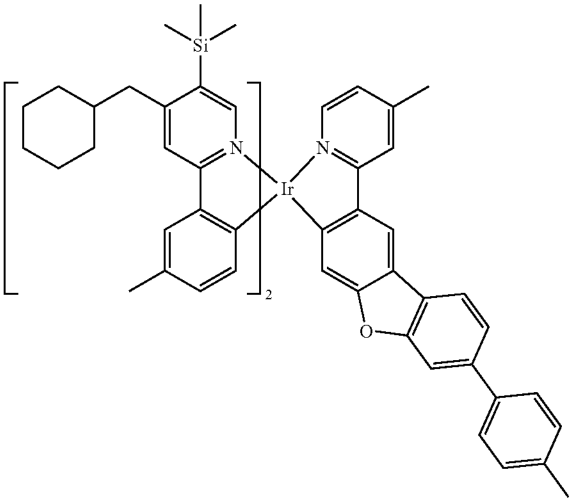
1623
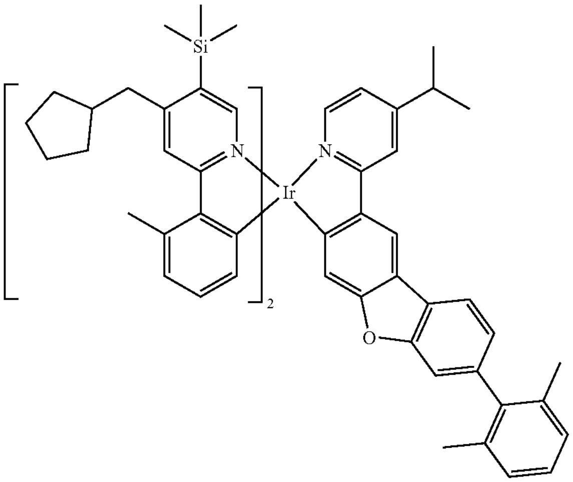
1624
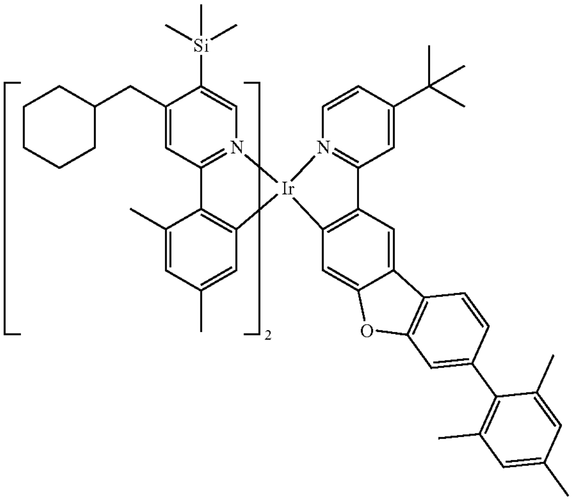

-continued
1625
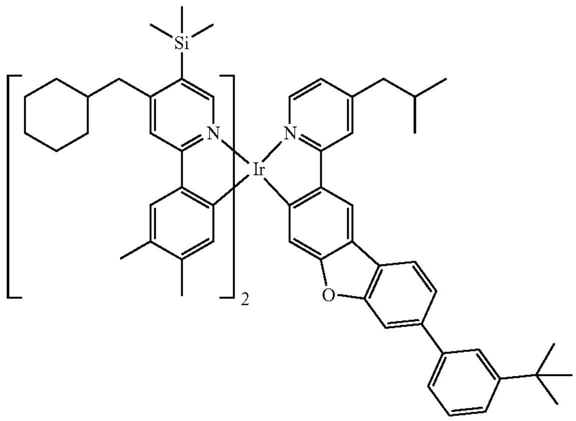
1626
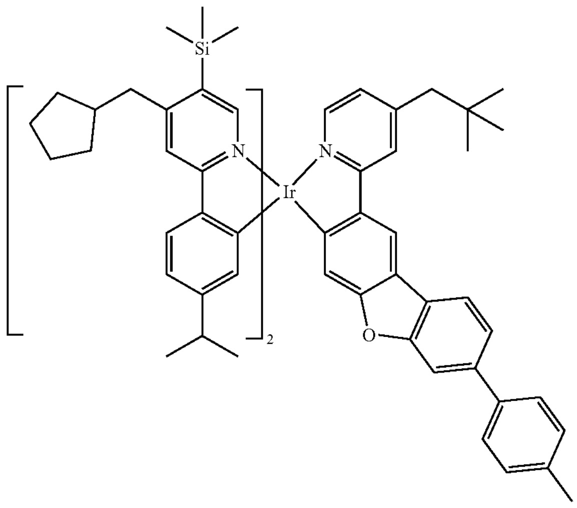
1627
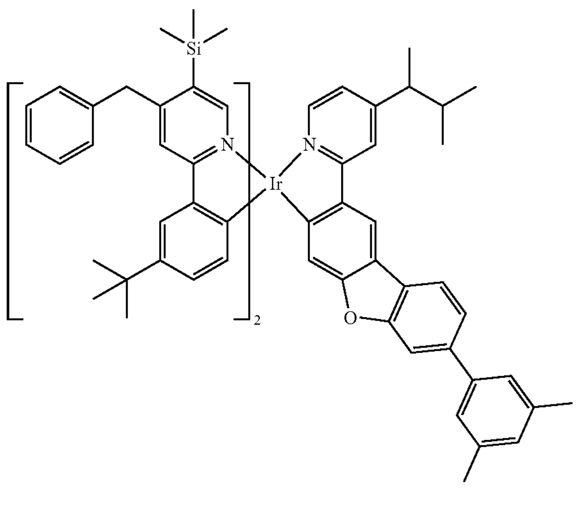
-continued
1628
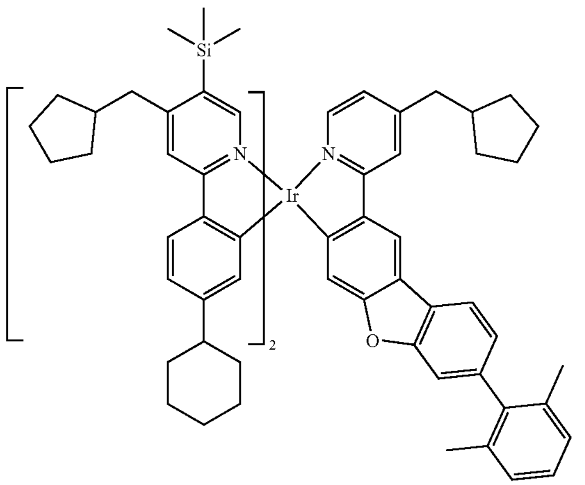
1629
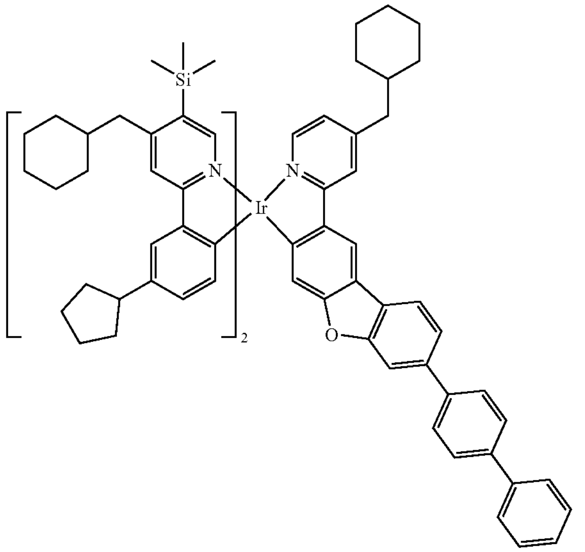
1630
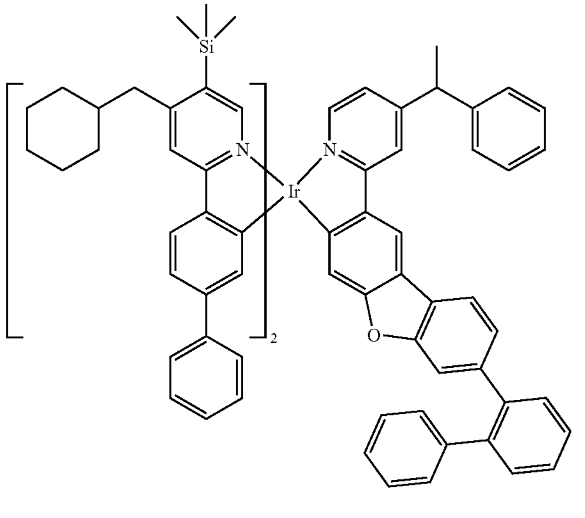

-continued
1631
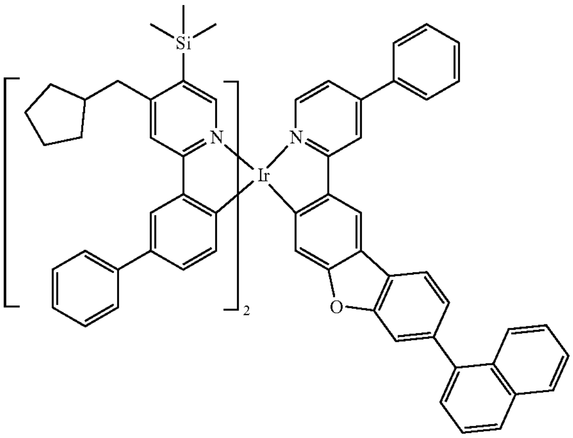
1632
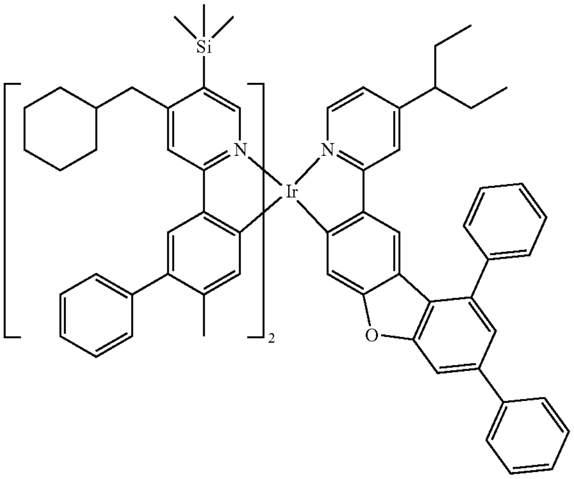
1633
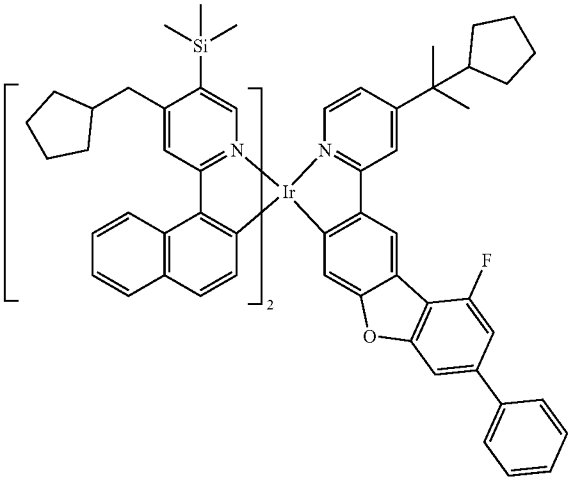
-continued
1634
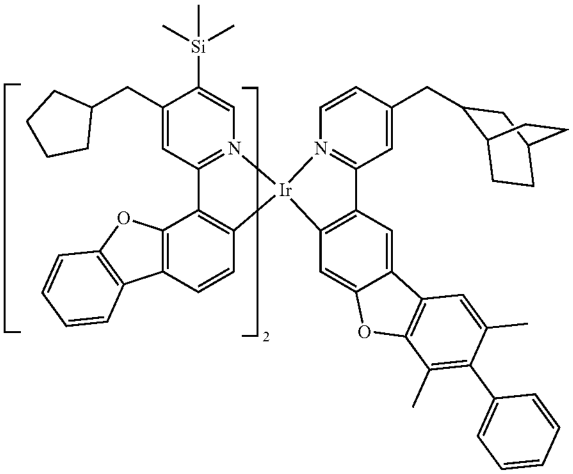
1635
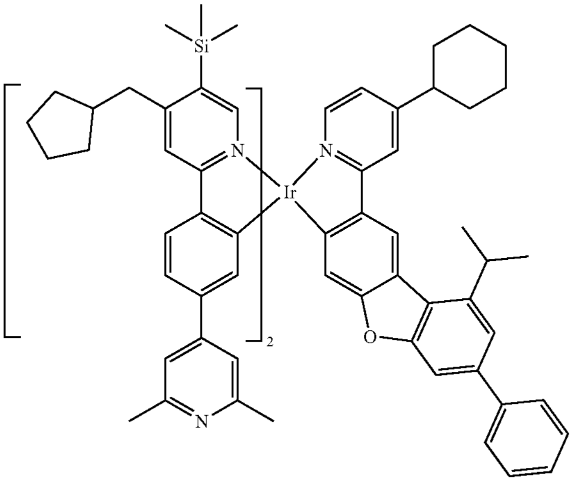
1636
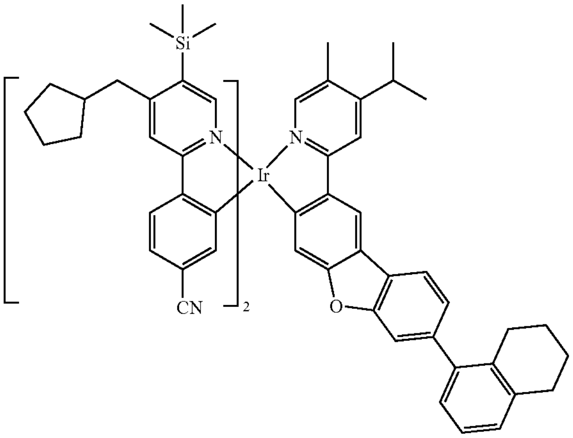

-continued
1637
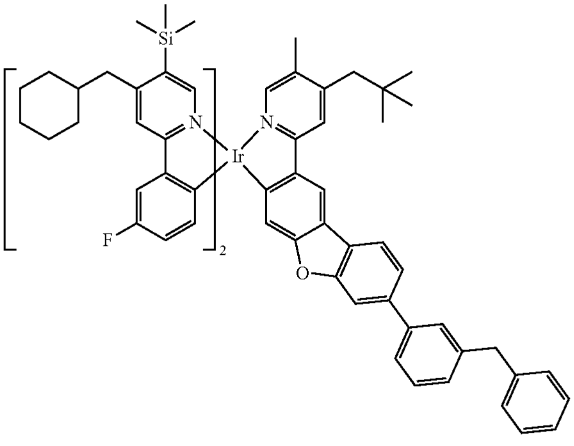
1638
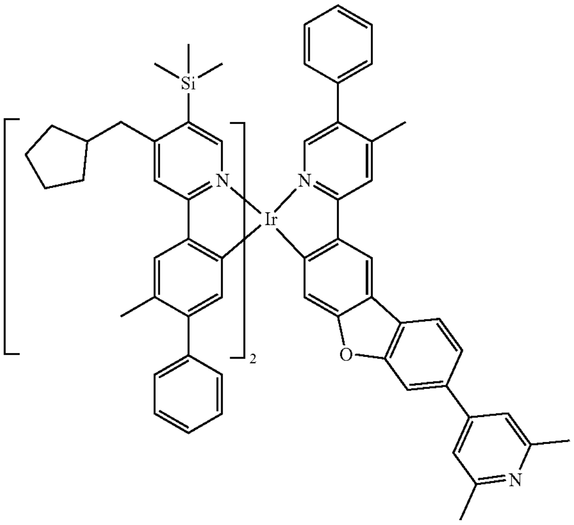
1639
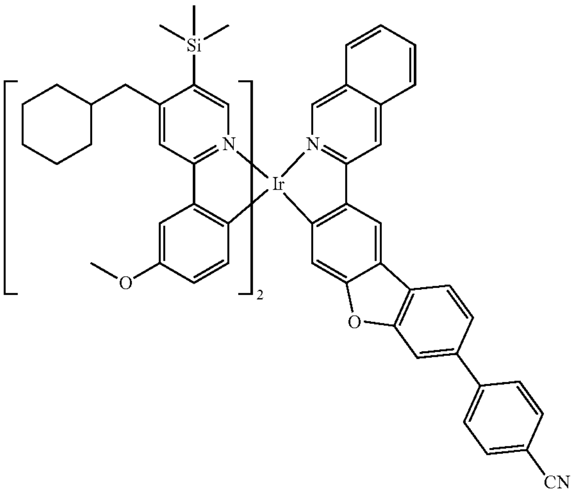
-continued
1640
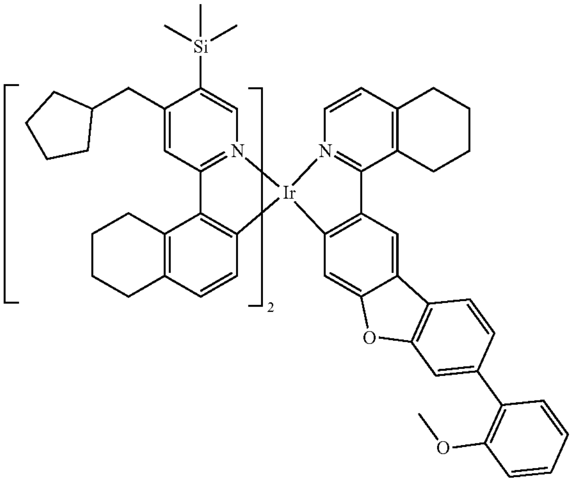
1641
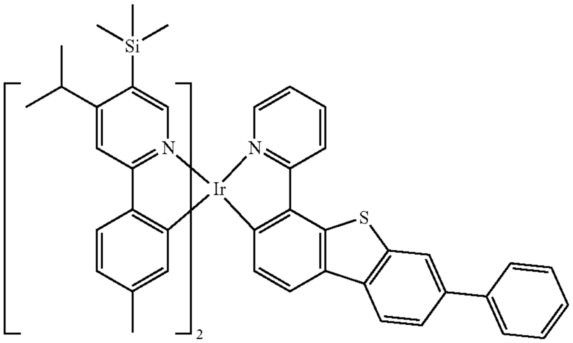
1642
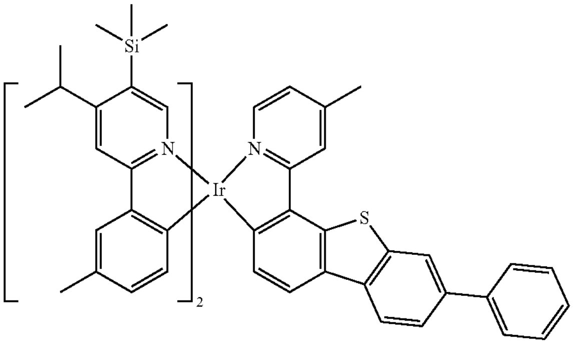
1643
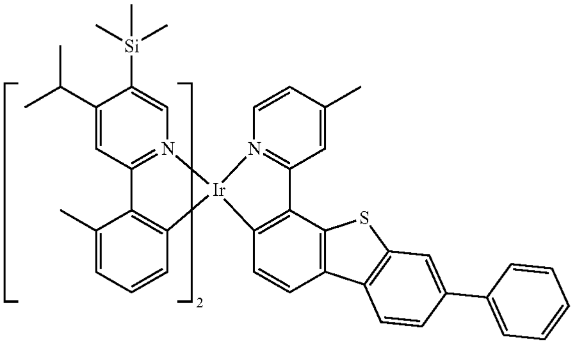

-continued
1644
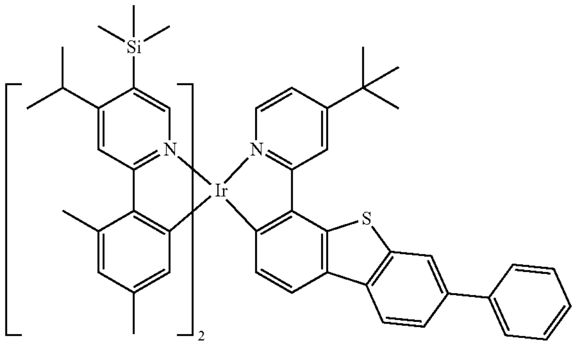
1645
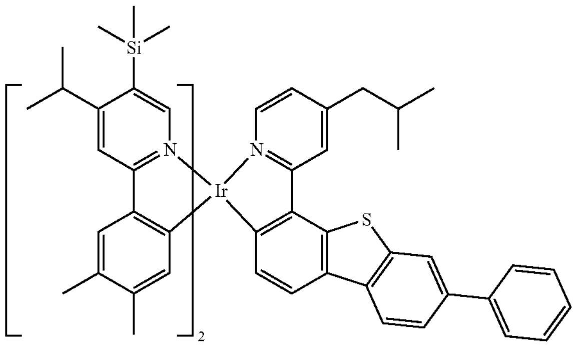
1646
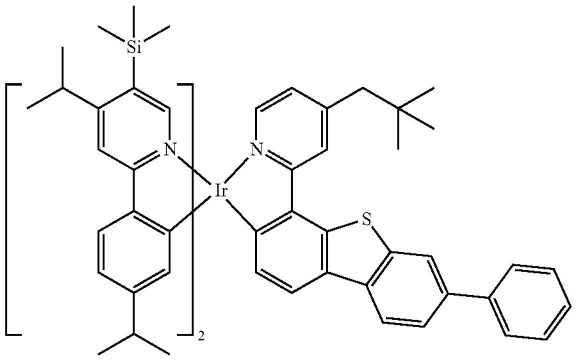
1647
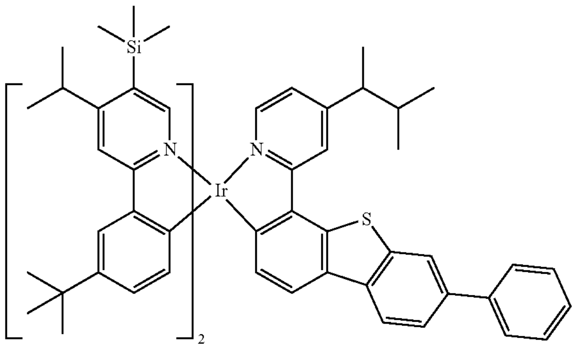
-continued
1648
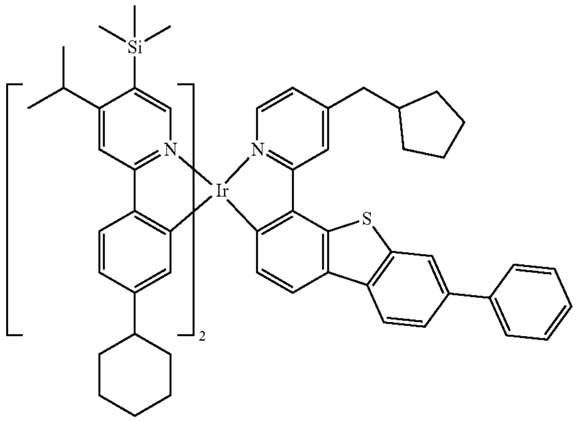
1649
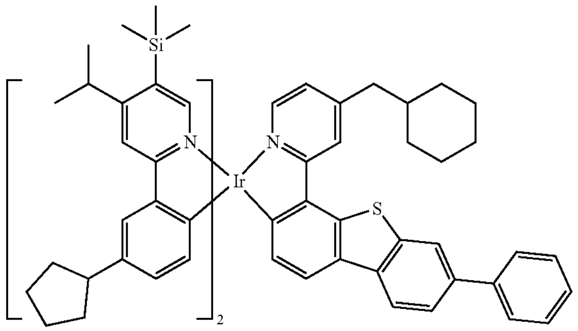
1650
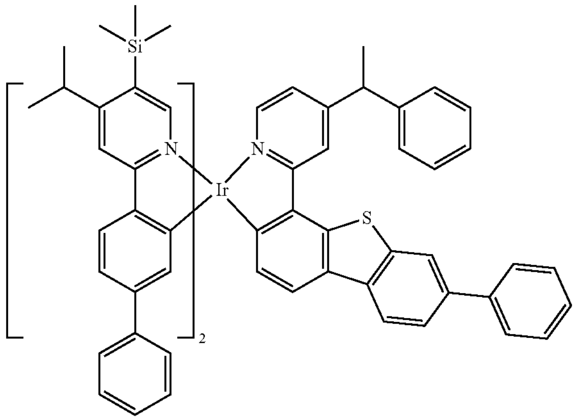
1651
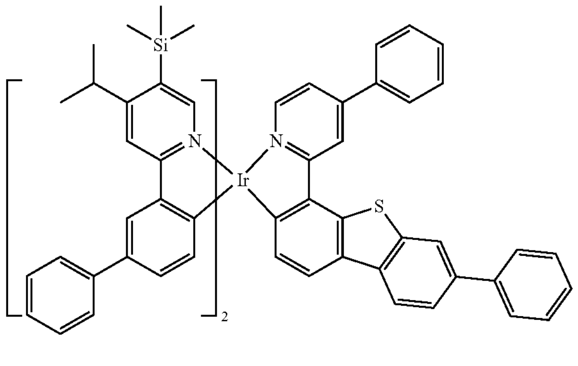

-continued
1652
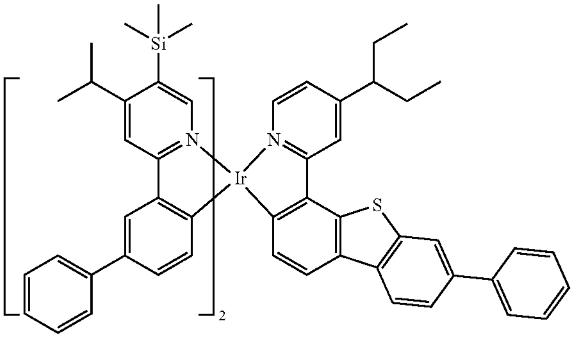
1653
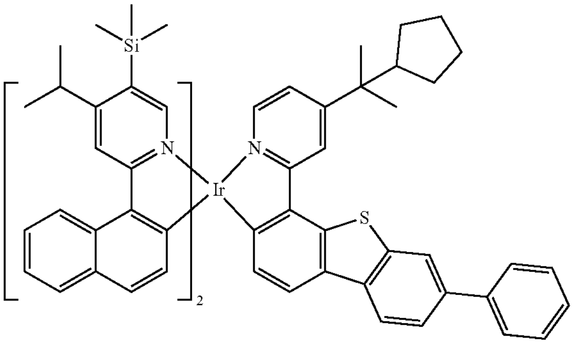
1654
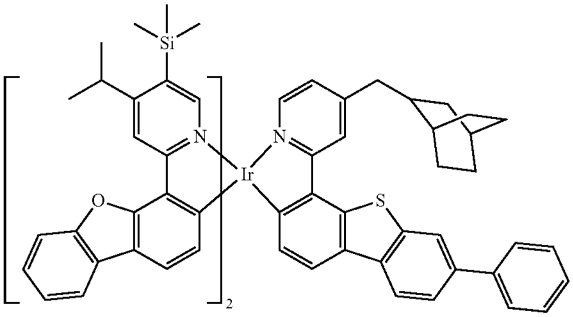
1655
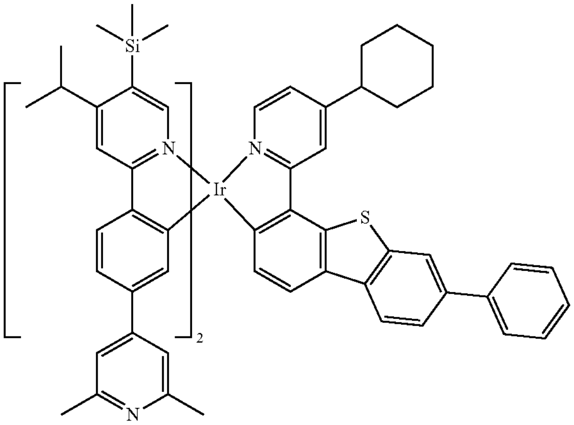
-continued
1656
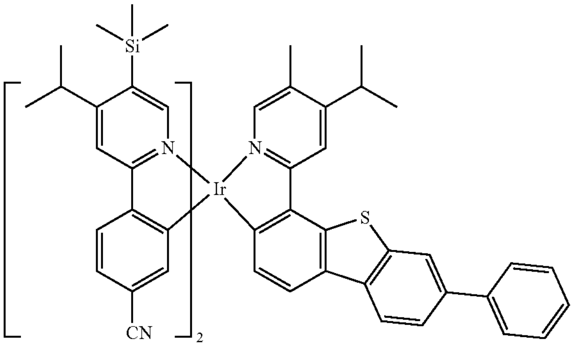
1657
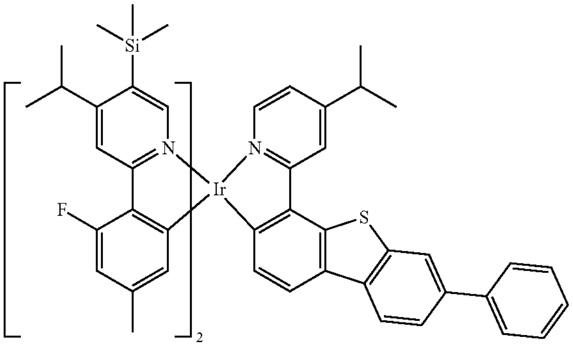
1658
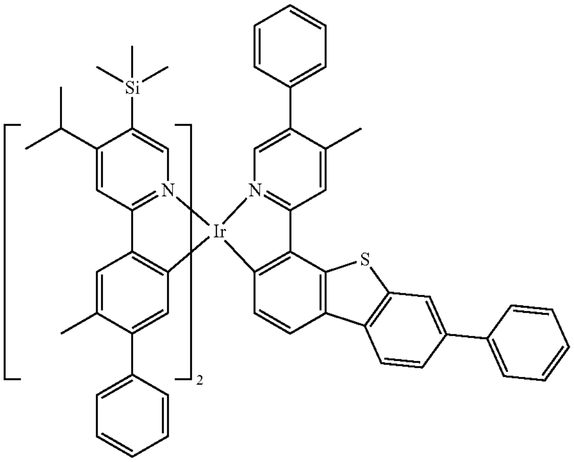
1659
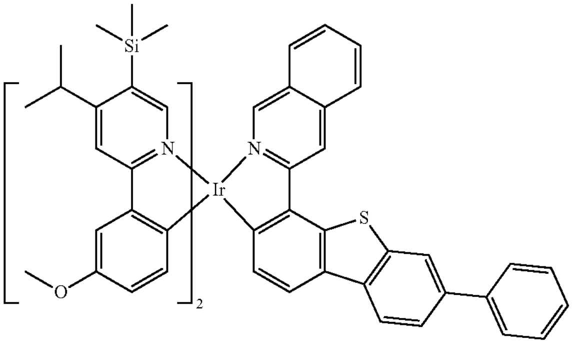

-continued
1660
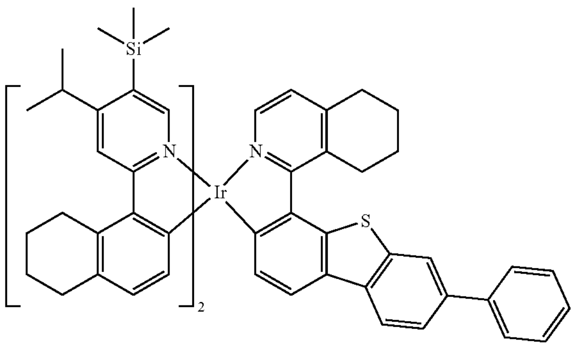
1661
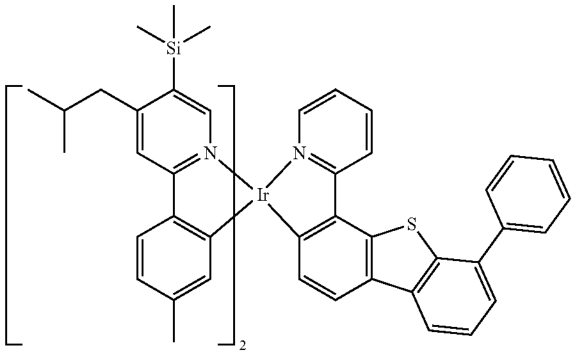
1662
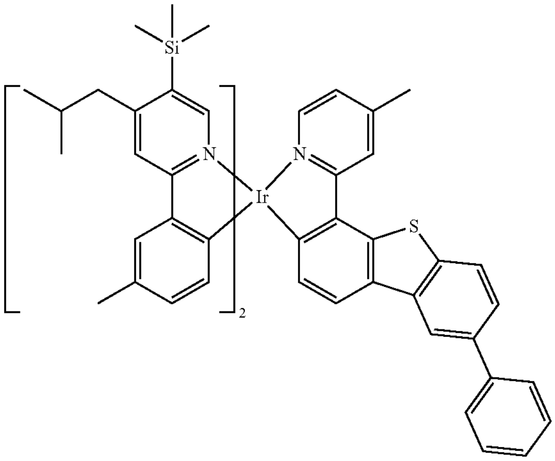
1663
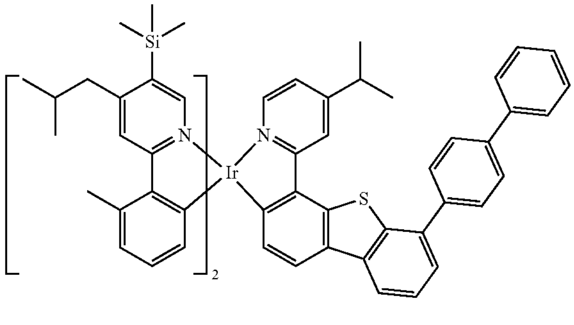
-continued
1664
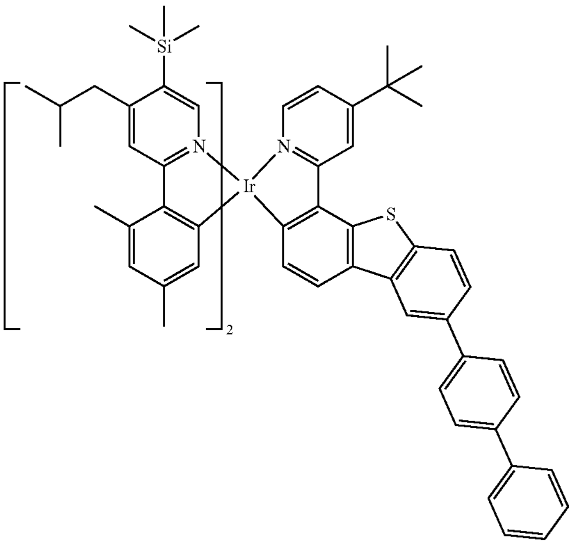
1665
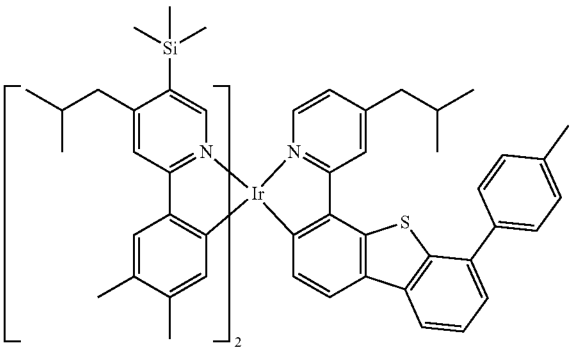
1666
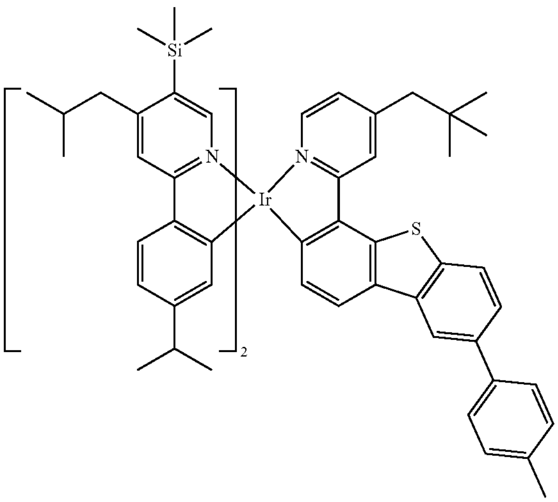

-continued
1667
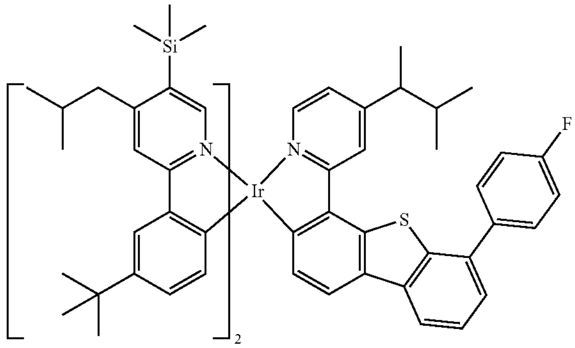
1668
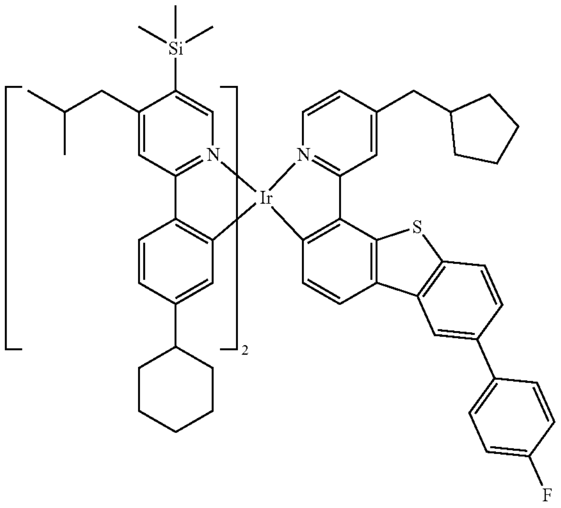
1669
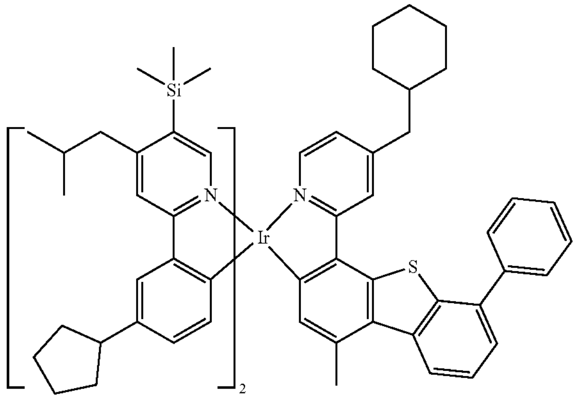
-continued
1670
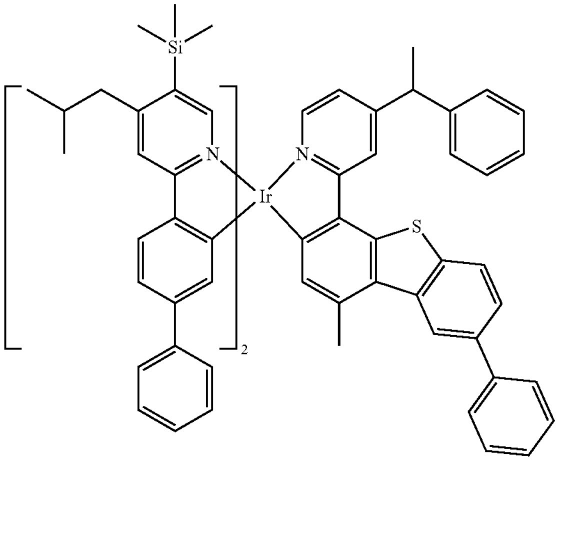
1671
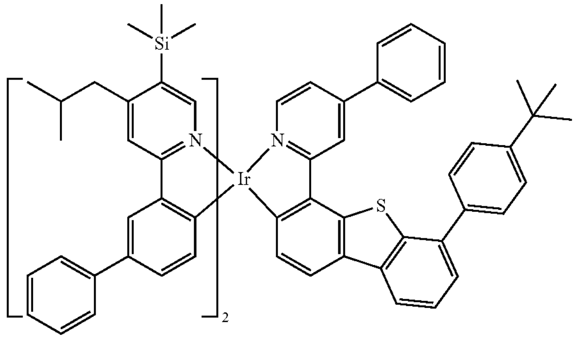
1672
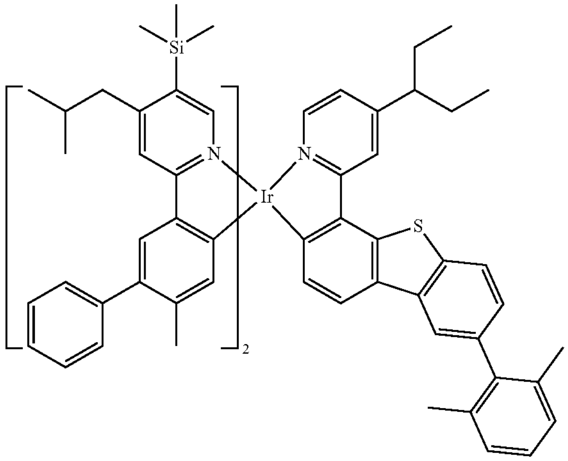

1673
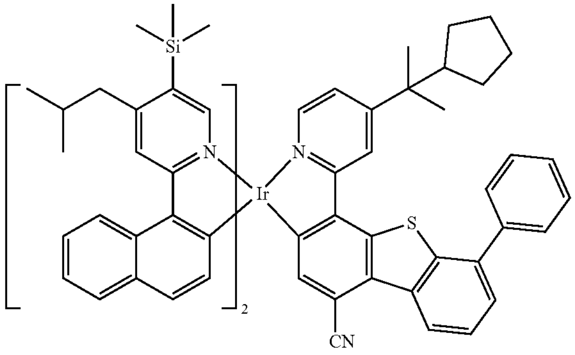
1674
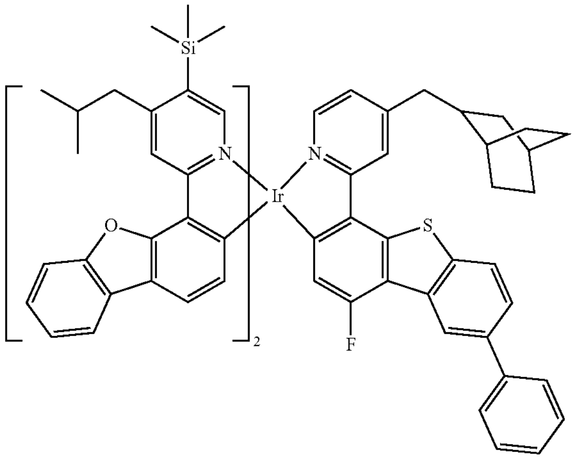
1675
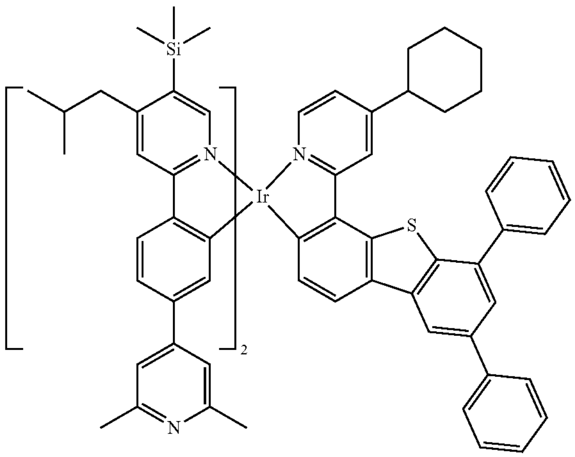
1676
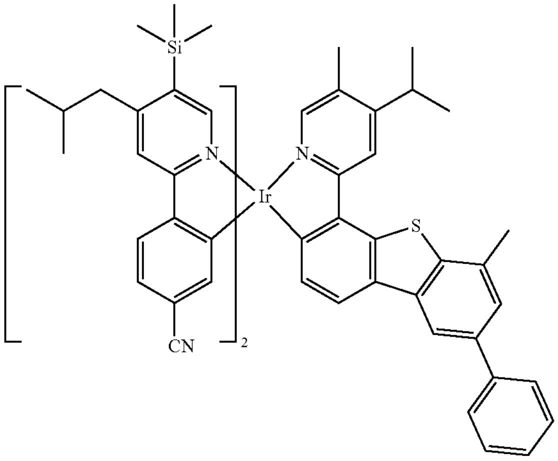
1677
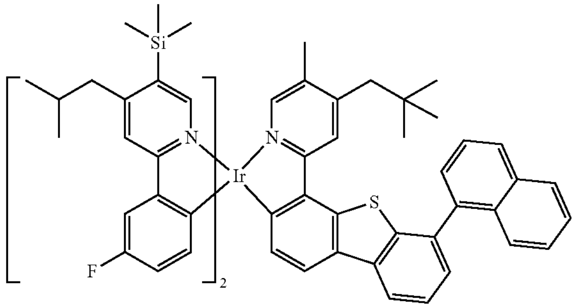
1678
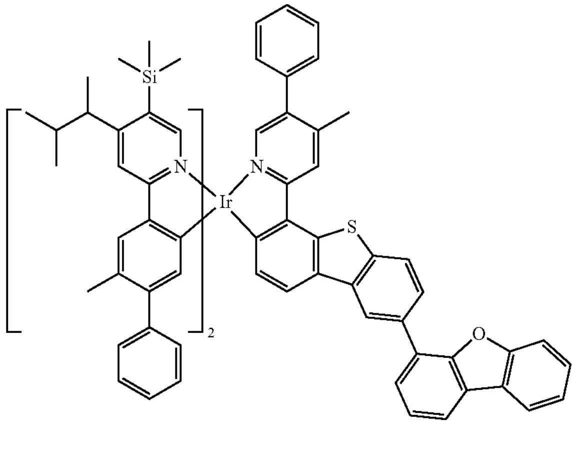
1679
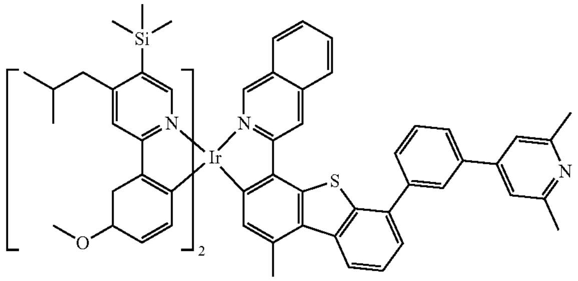

-continued
1680
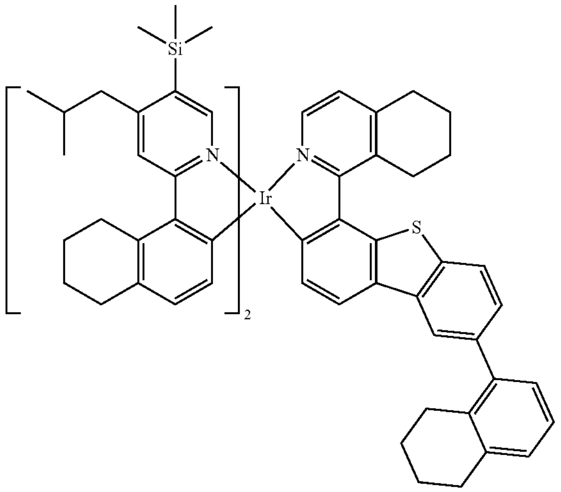
1681
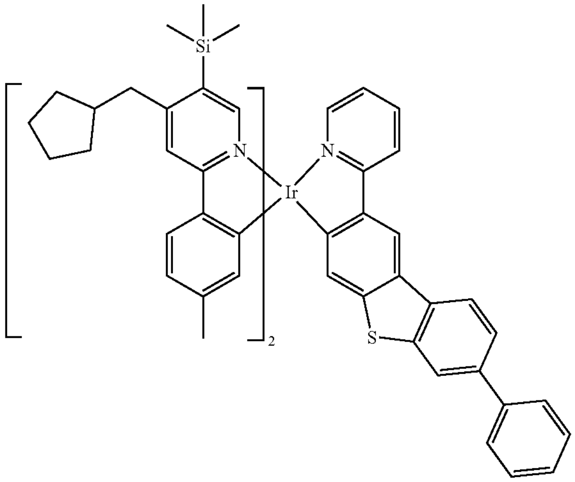
1682
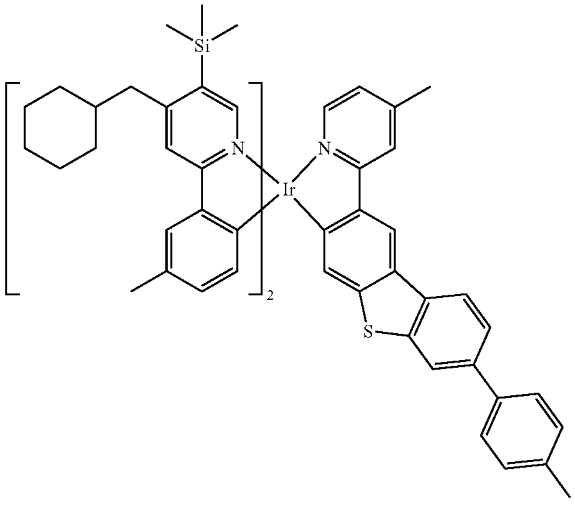
-continued
1683
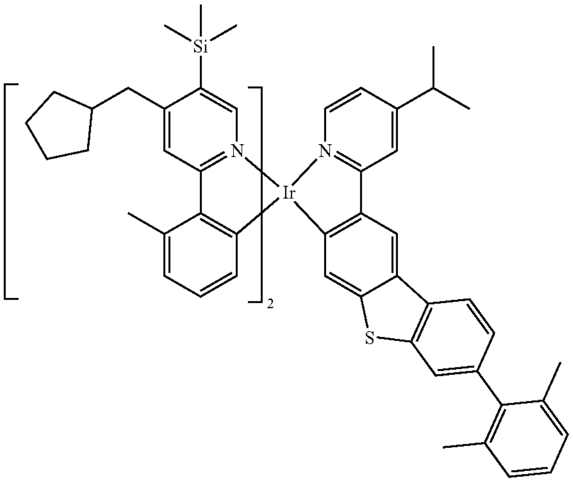
1684
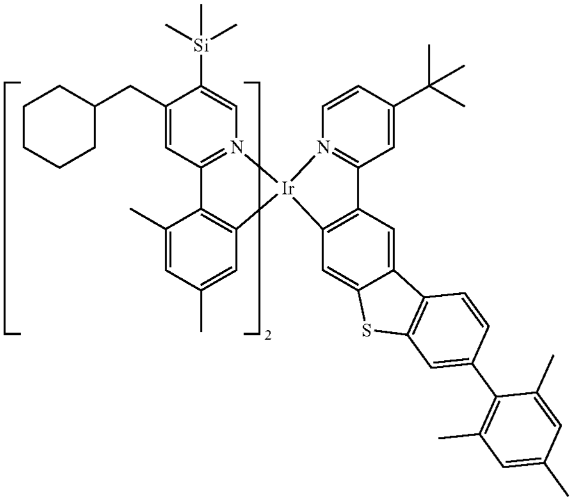
1685
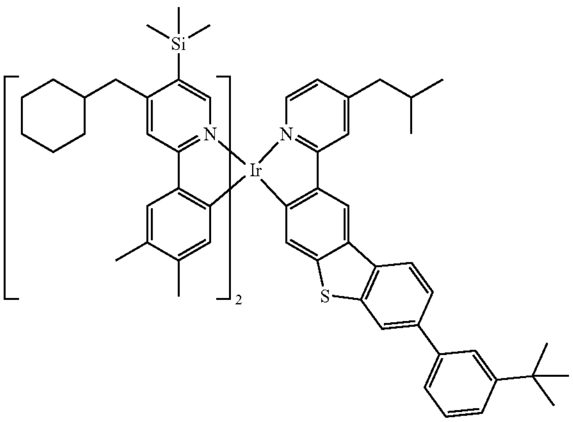

-continued
1686
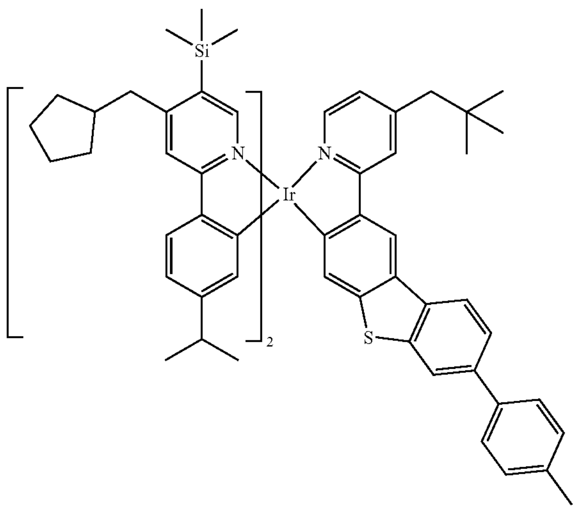
1687
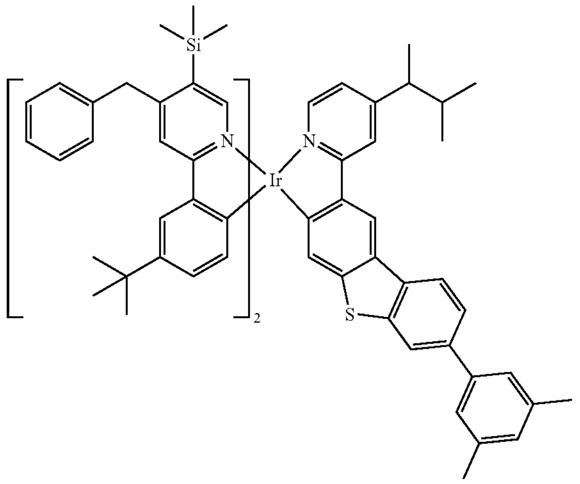
1688
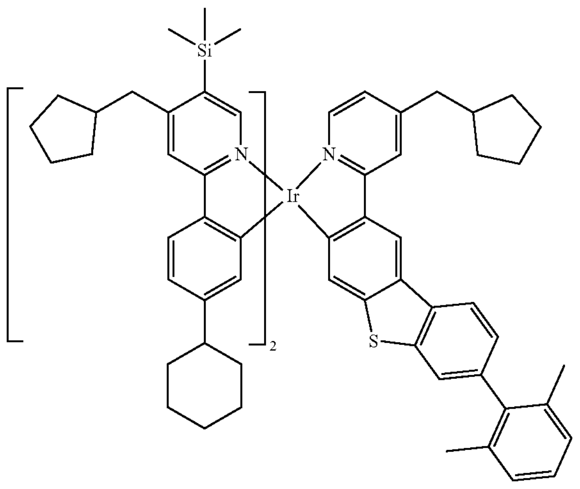
-continued
1689
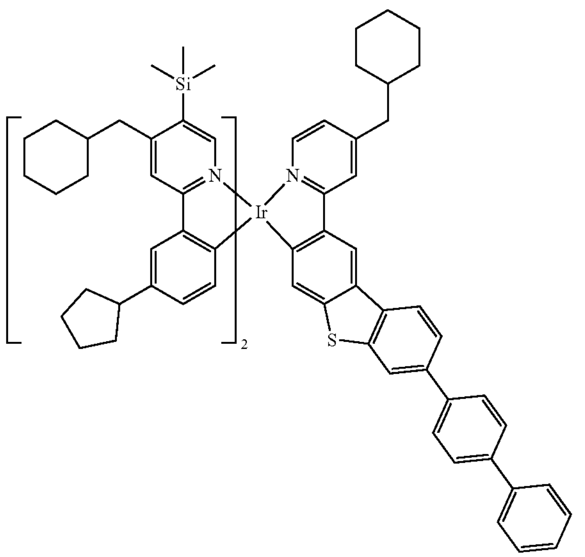
1690
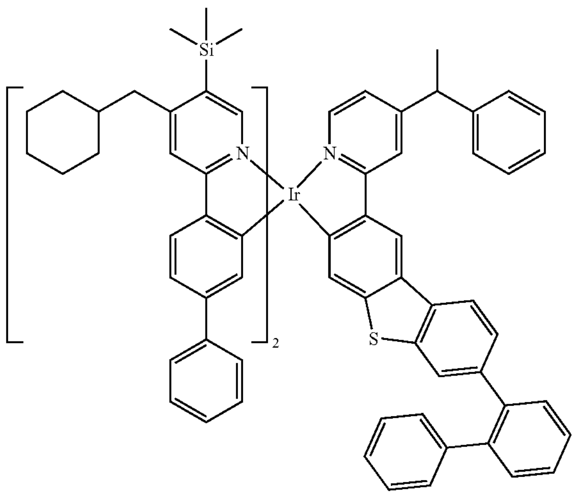
1691
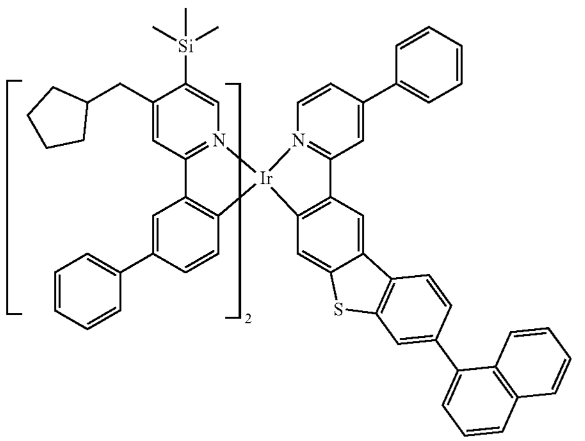

-continued
1692
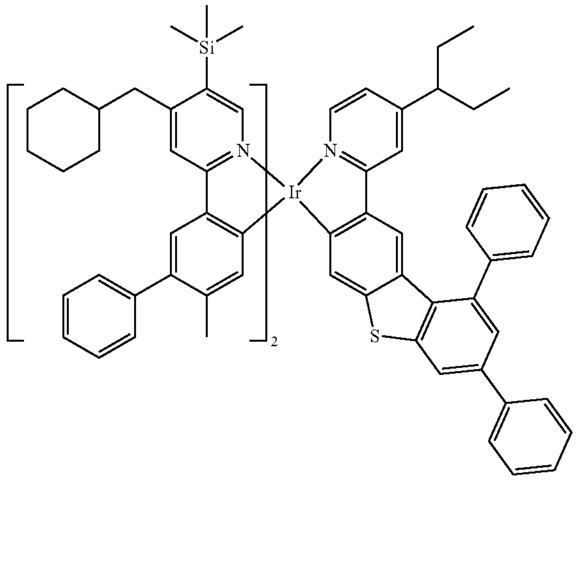
1693
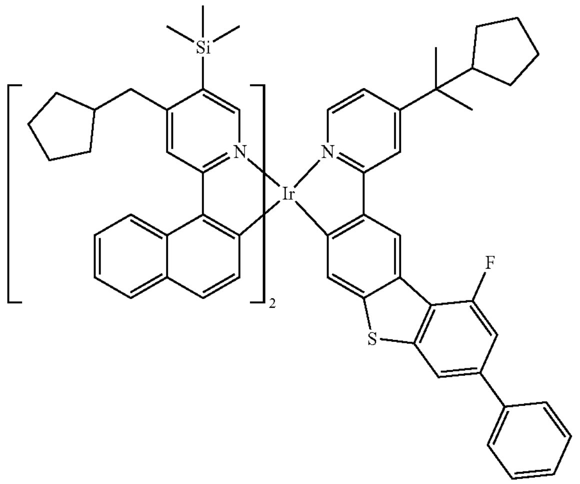
1694
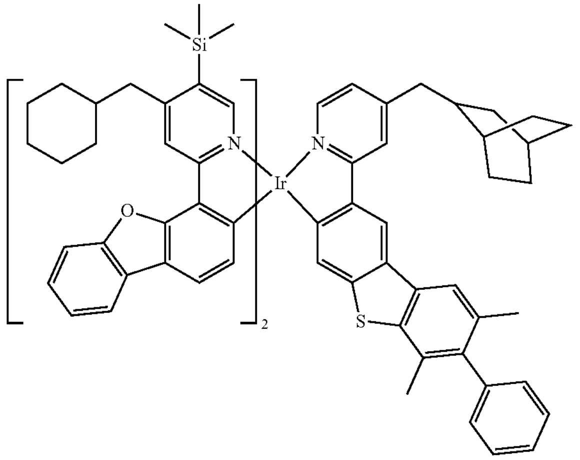
-continued
1695
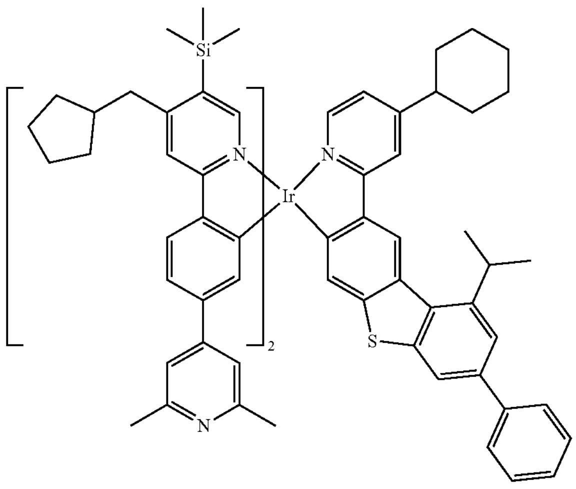
1696
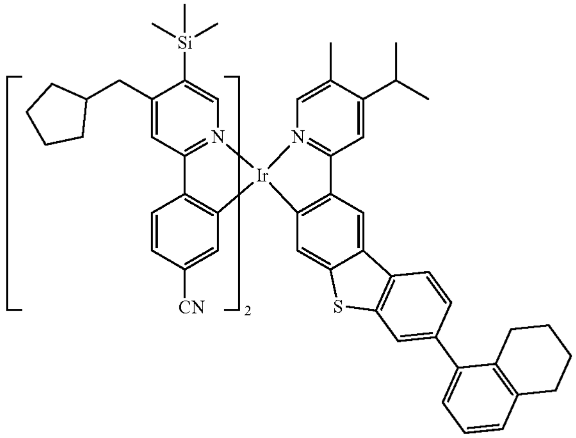
1697
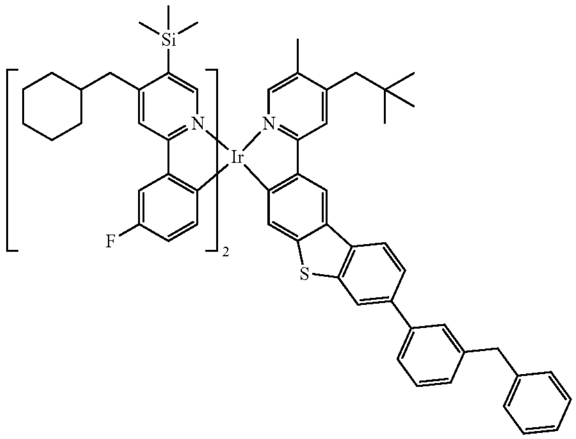

-continued
1698
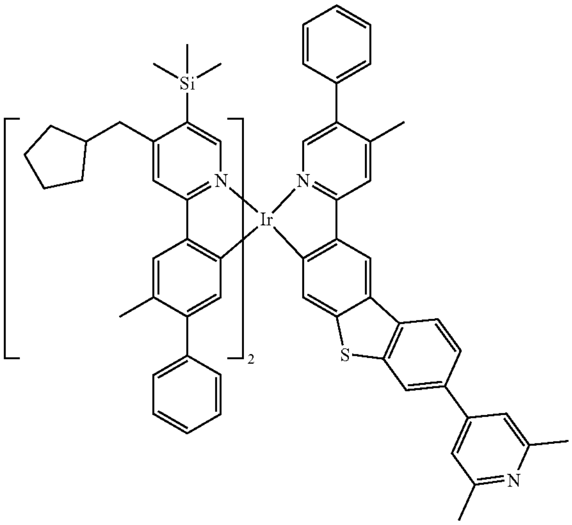
1699
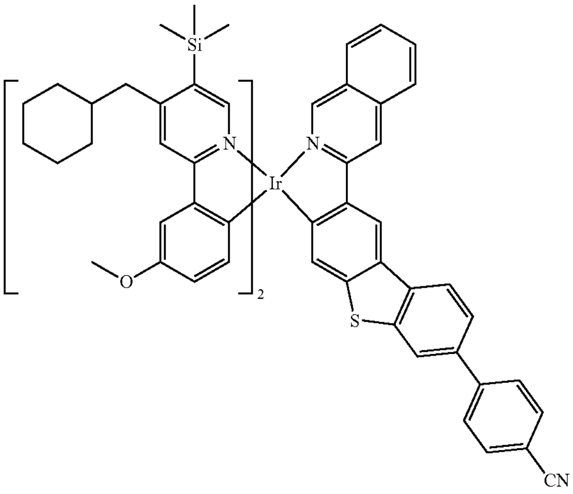
1700
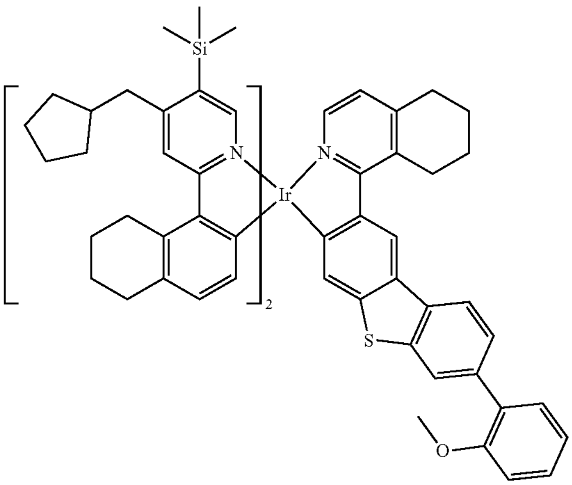
-continued
1701
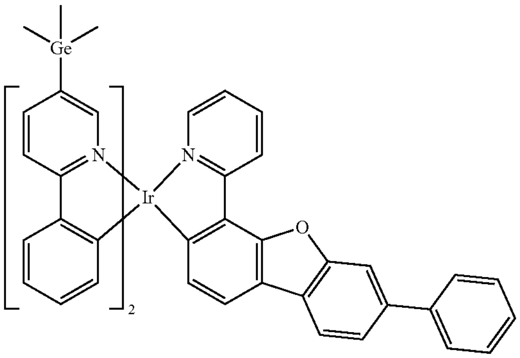
1702
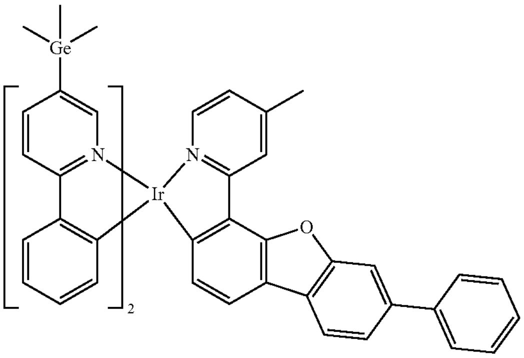
1703
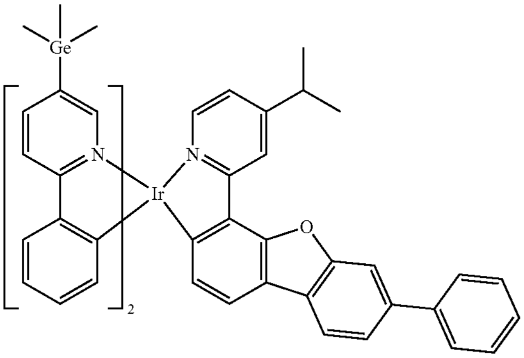
1704
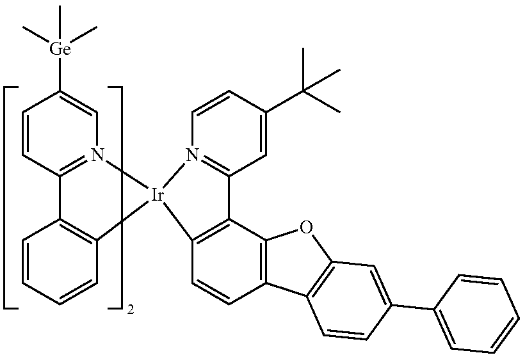

-continued
1705
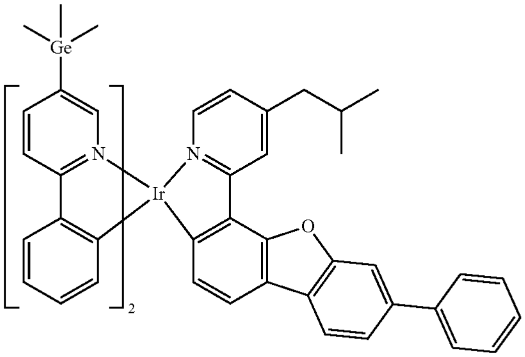
1706
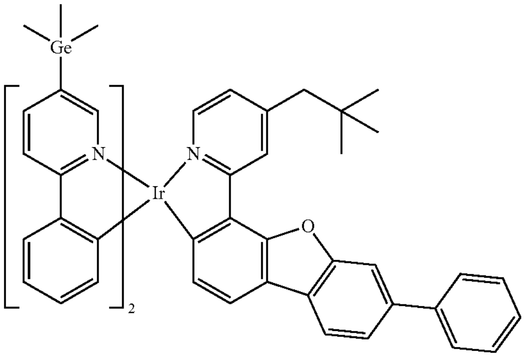
1707
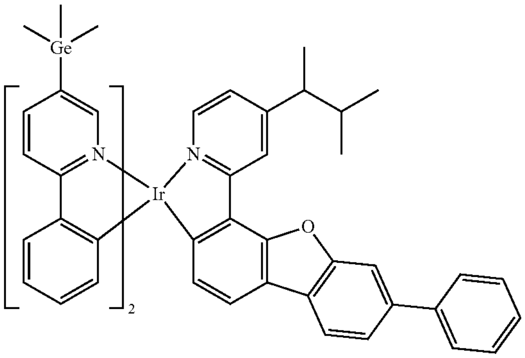
1708
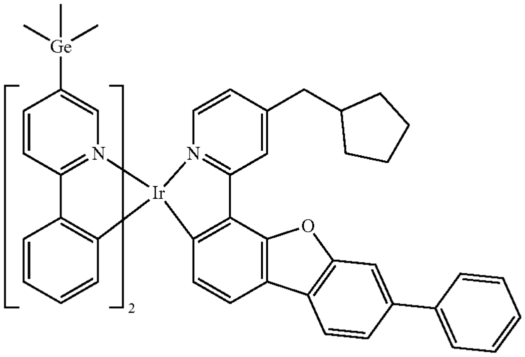
-continued
1709
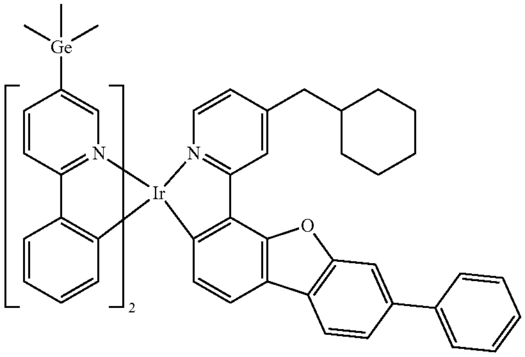
1710
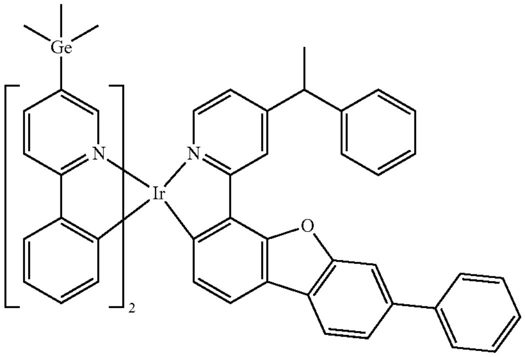
1711
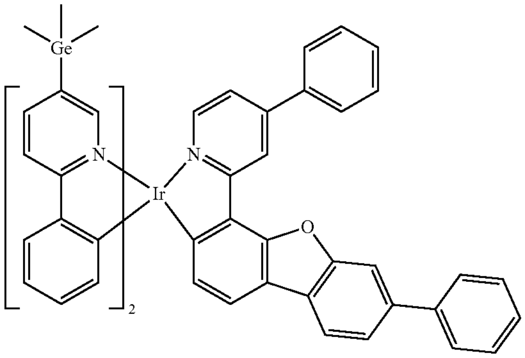
1712
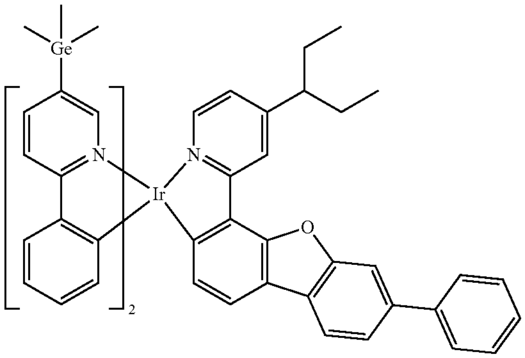

1713
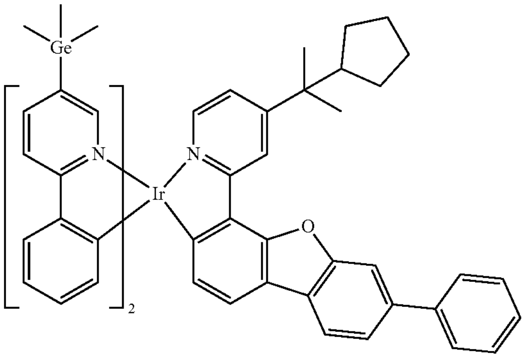
1714
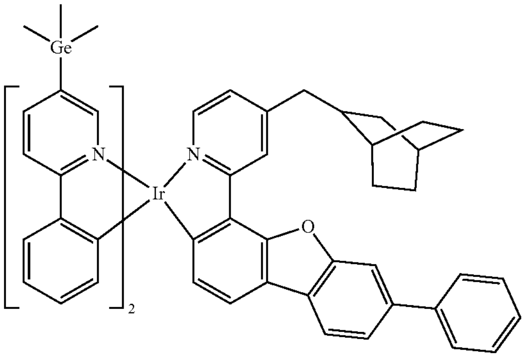
1715
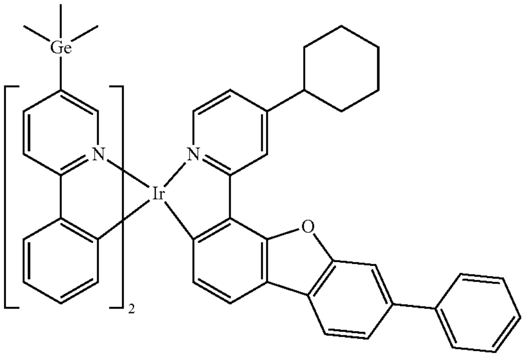
1716
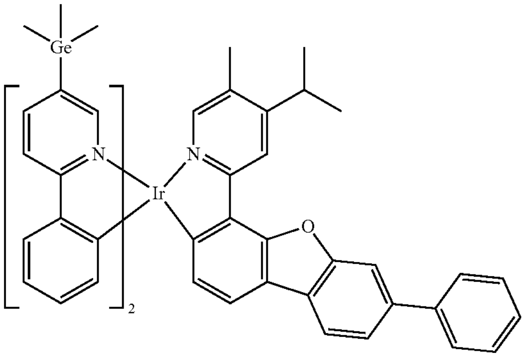
1717
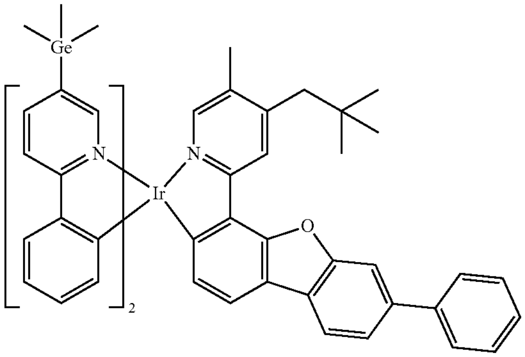
1718
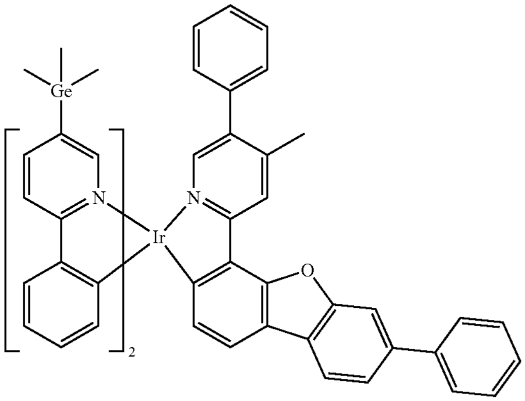
1719
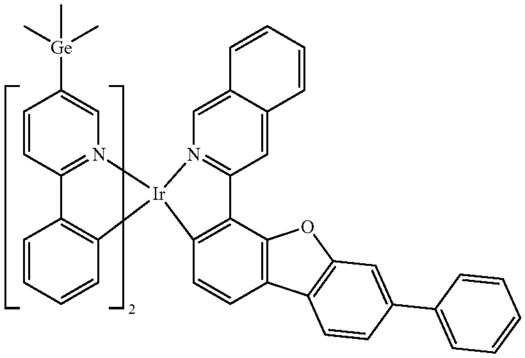
1720
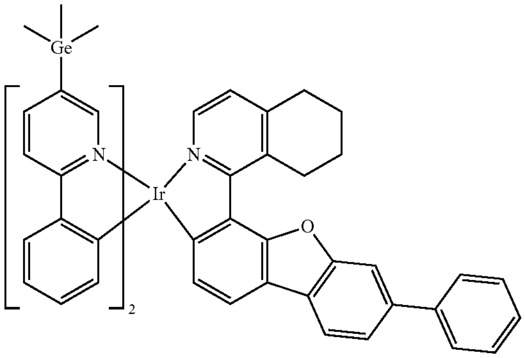

-continued
1721
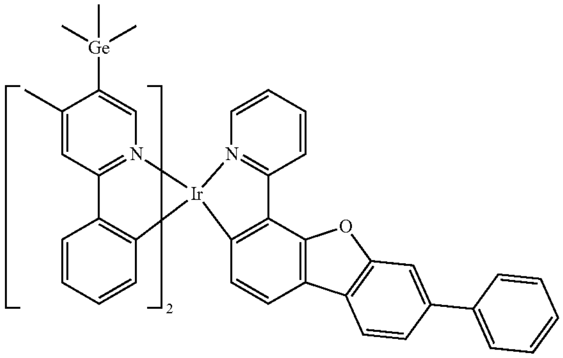
1722
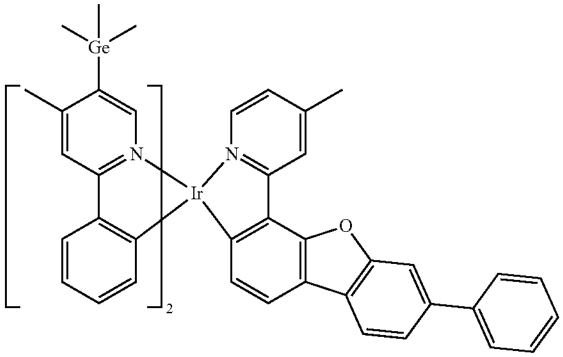
1723
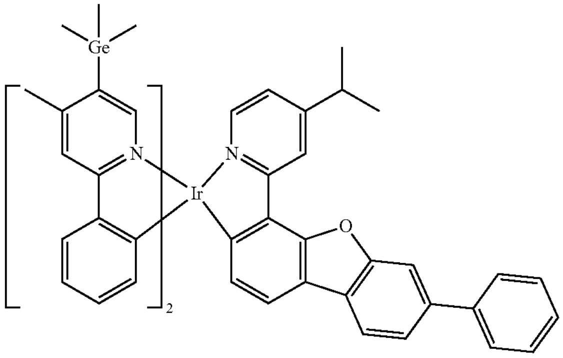
1724
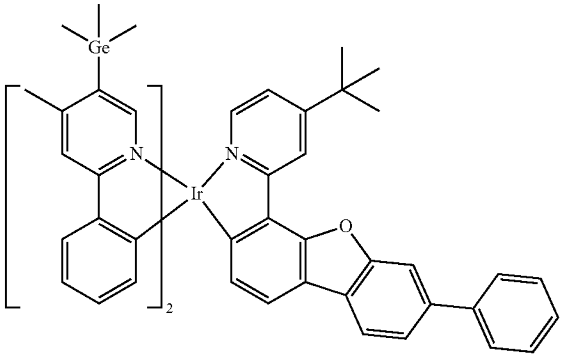
-continued
1725
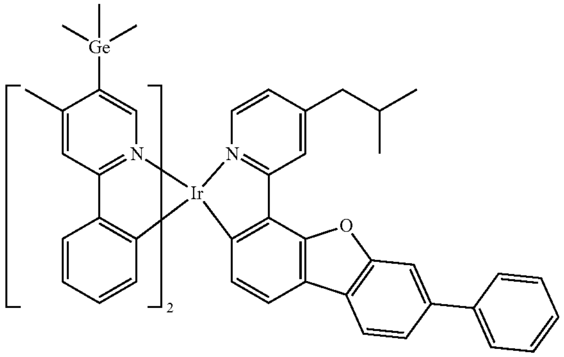
1726
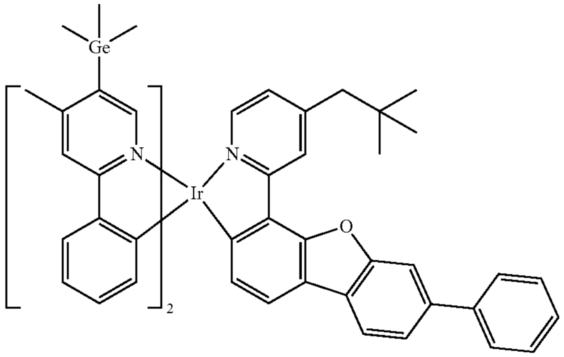
1727
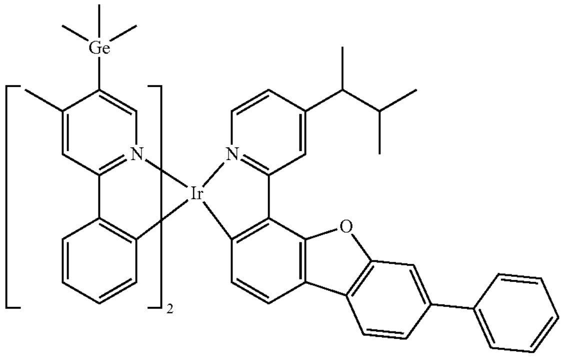
1728
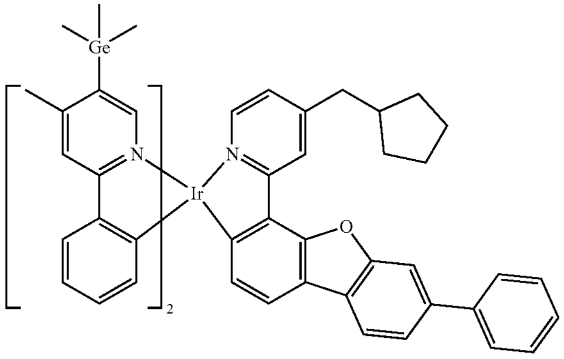

-continued
1729
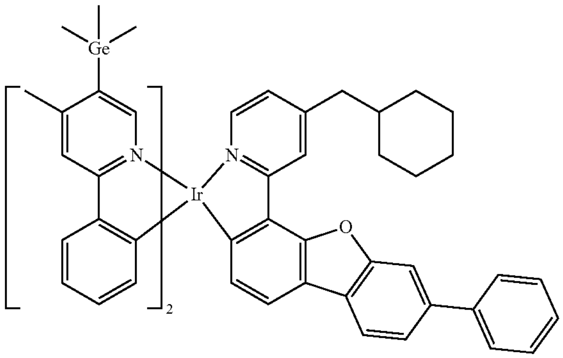
1730
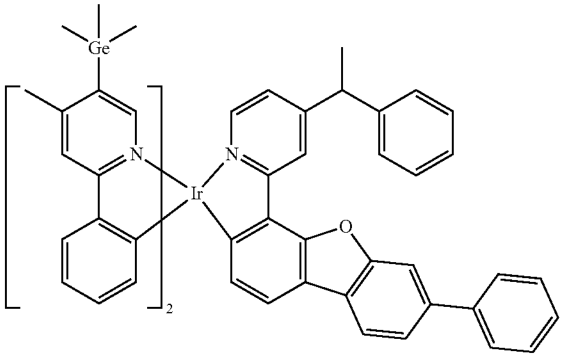
1731
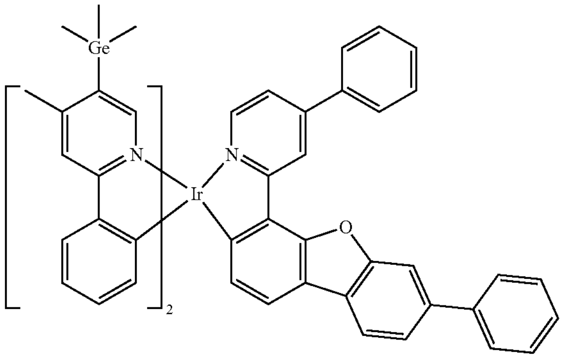
1732
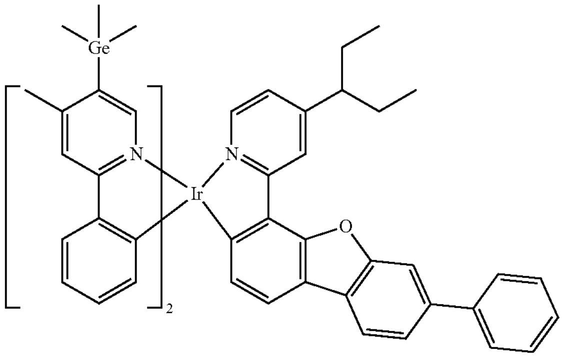
-continued
1733
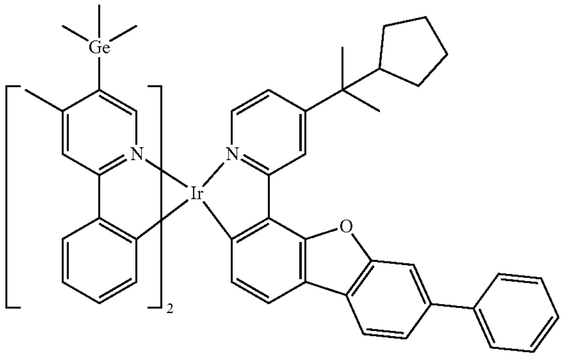
1734
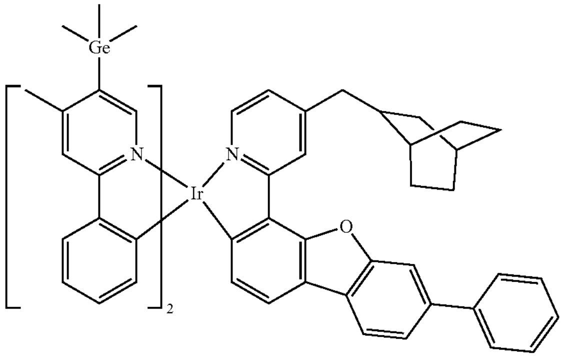
1735
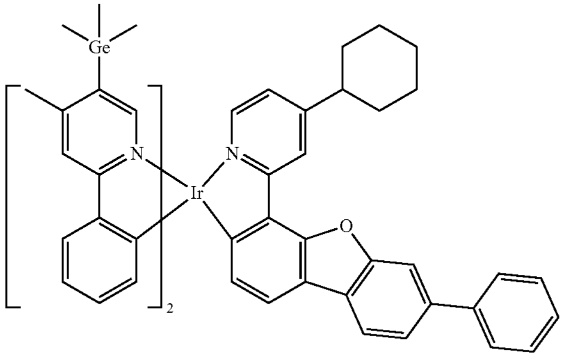
1736
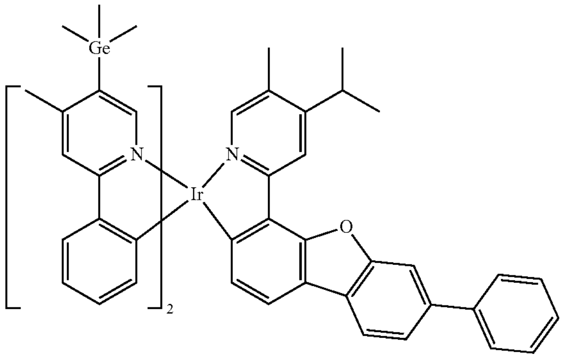

-continued
1737
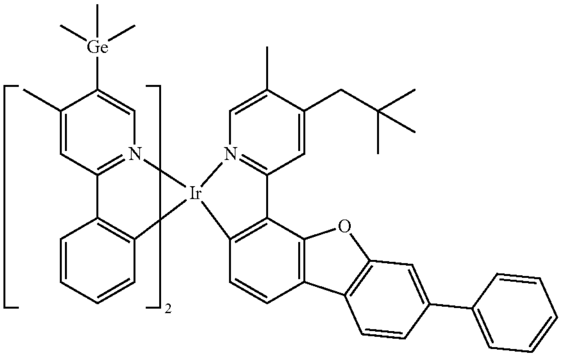
1738
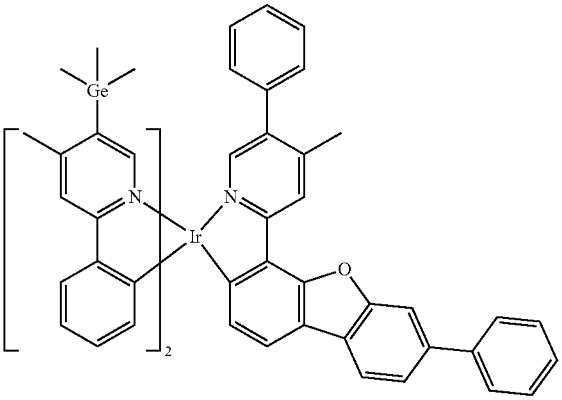
1739
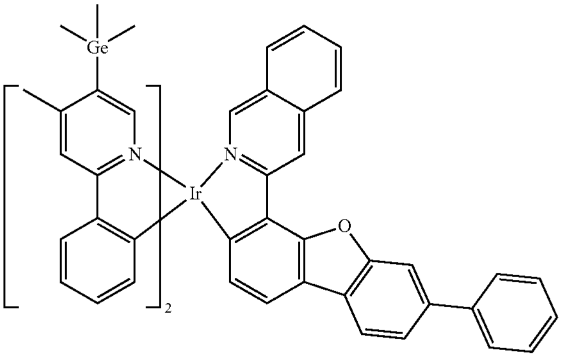
1740
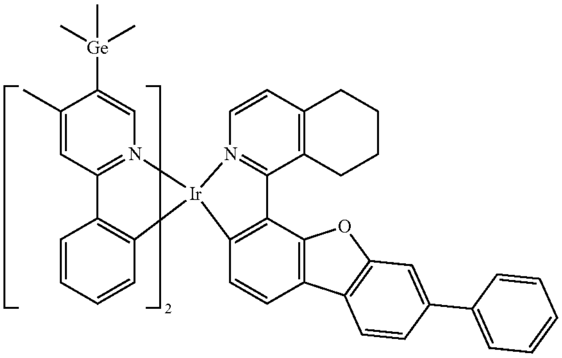
-continued
1741
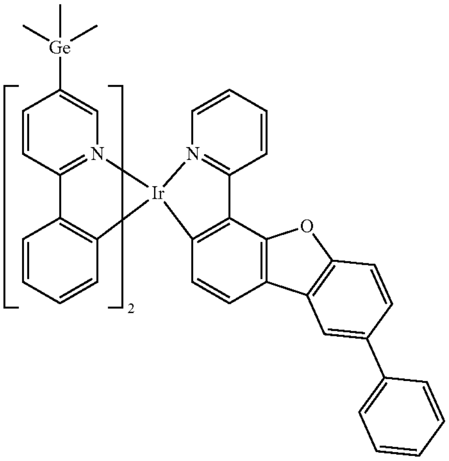
1742
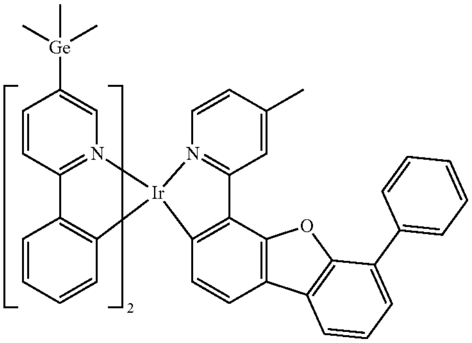
1743
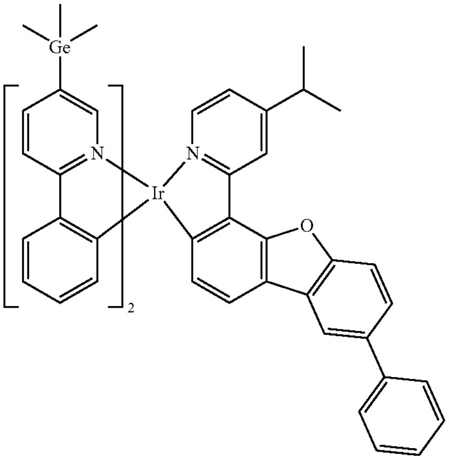
1744
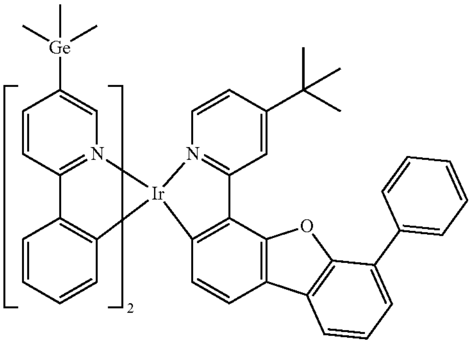

-continued
1745
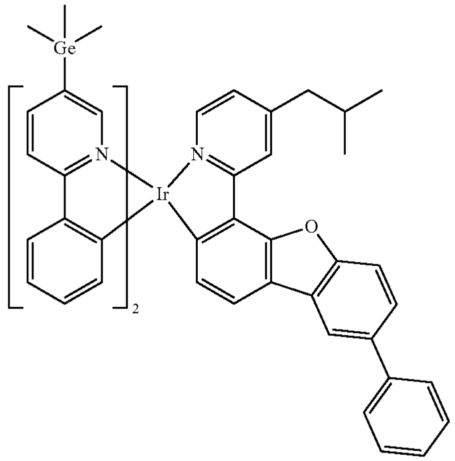
1746
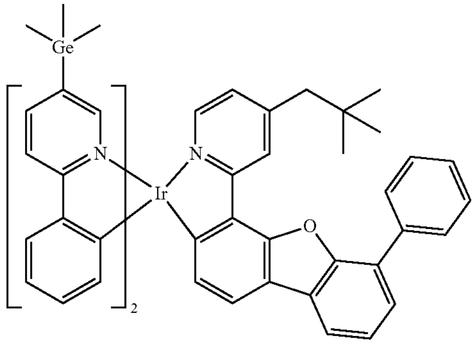
1747
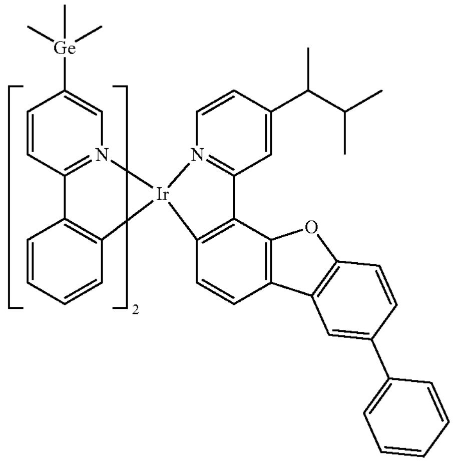
1748
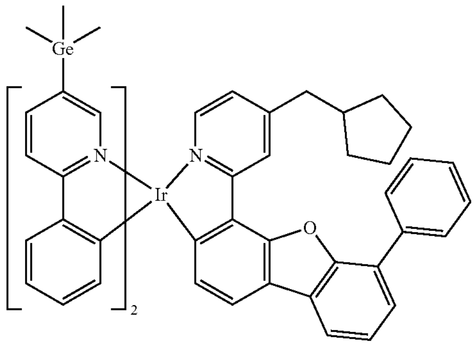
-continued
1749
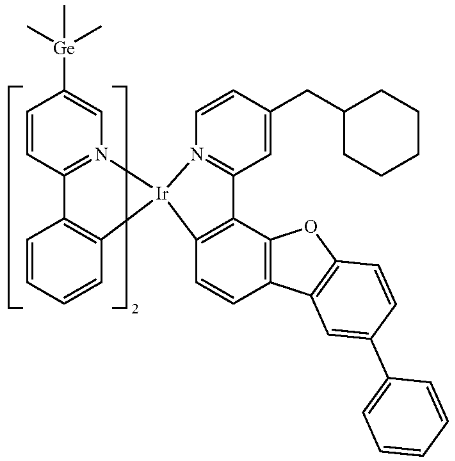
1750
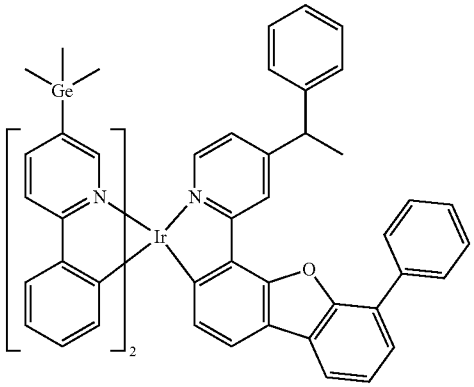
1751
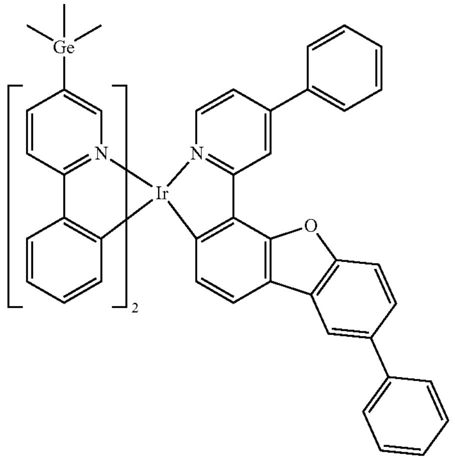

-continued
1752
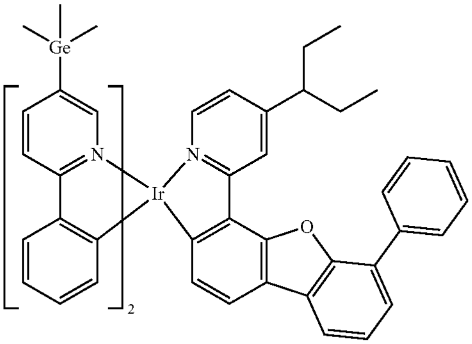
1753
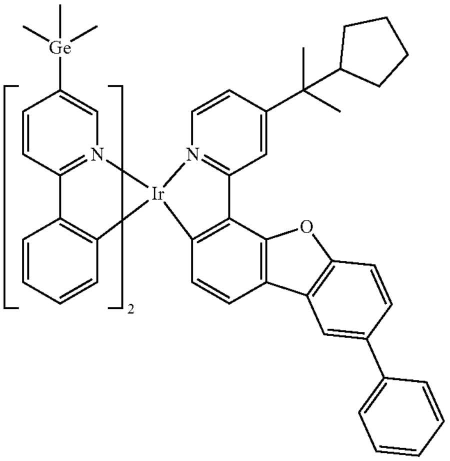
1754
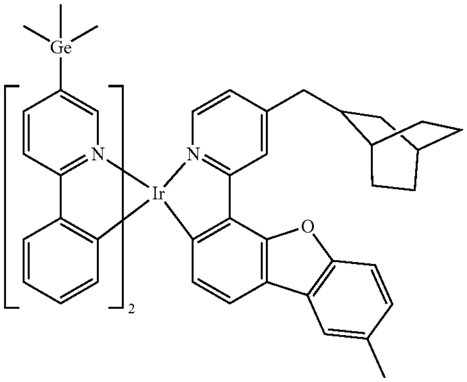
1755
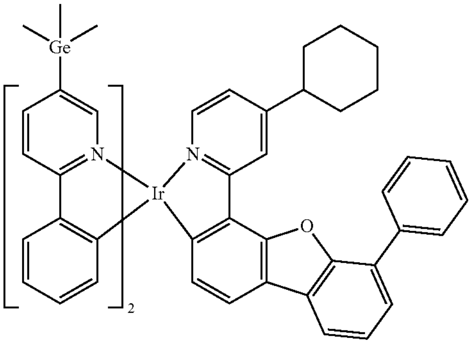
-continued
1756
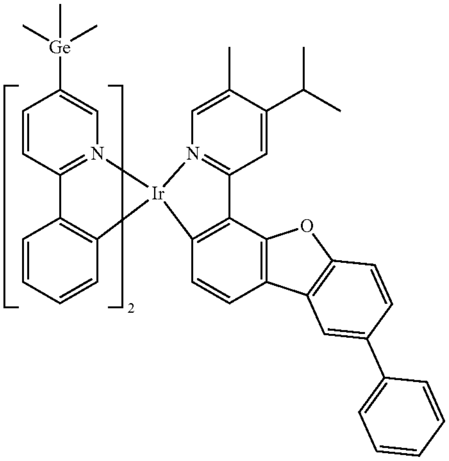
1757
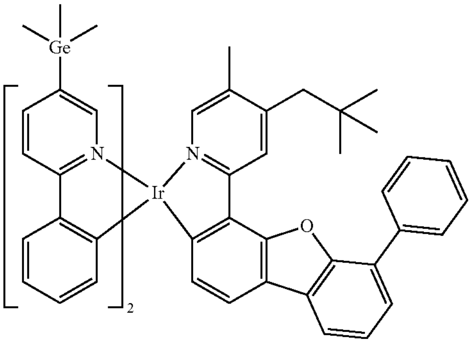
1758
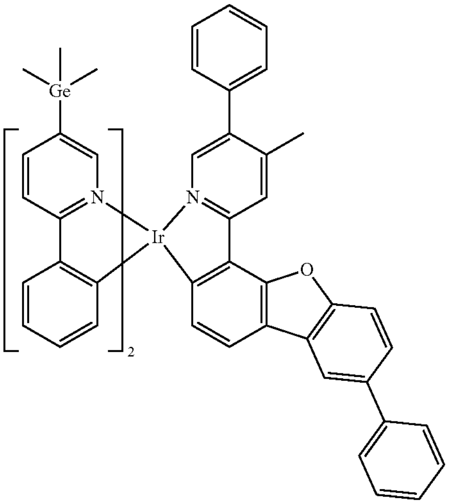

-continued
1759
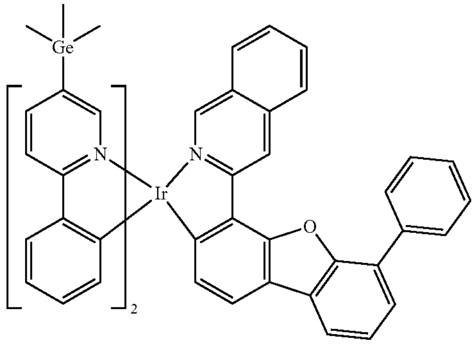
1760
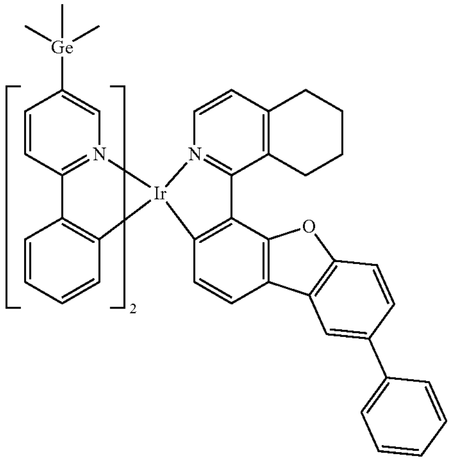
1761
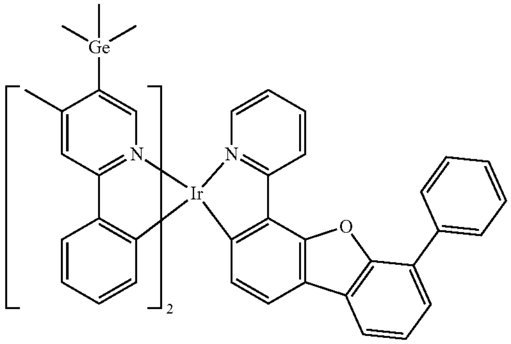
1762
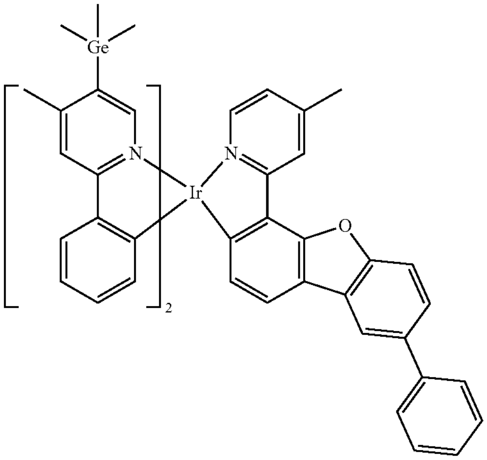
-continued
1763
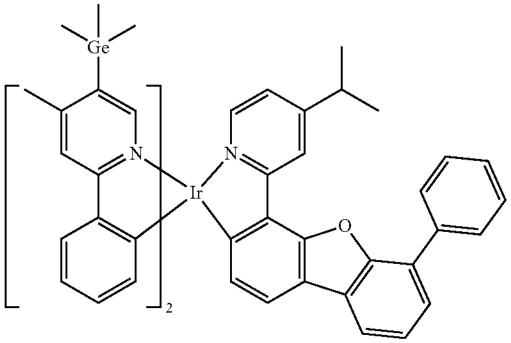
1764
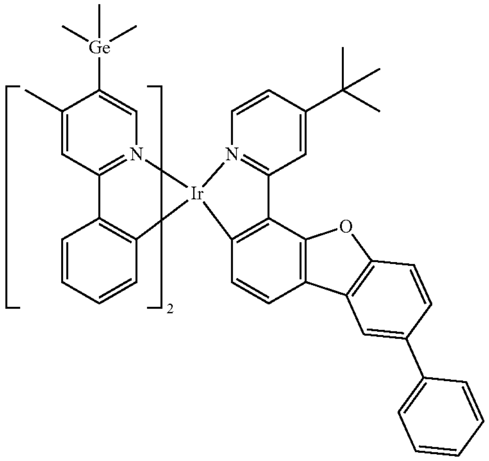
1765
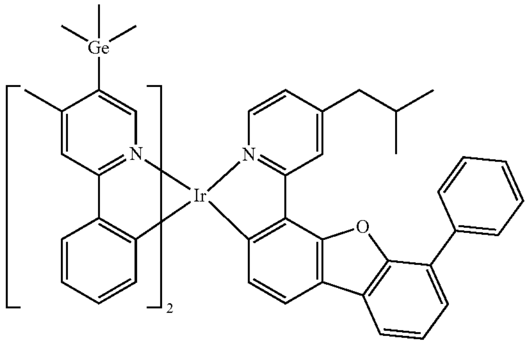

-continued
1766
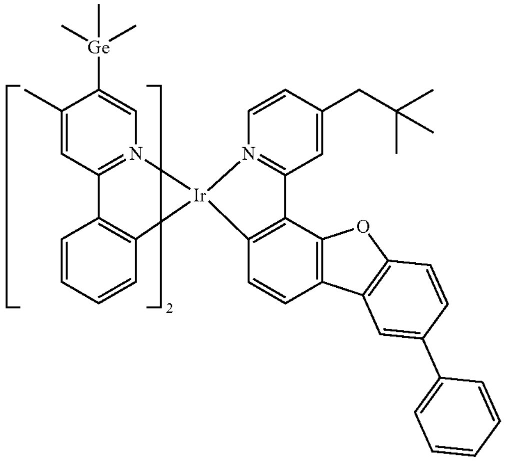
1767
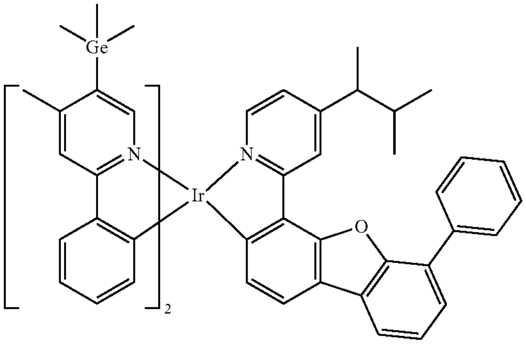
1768
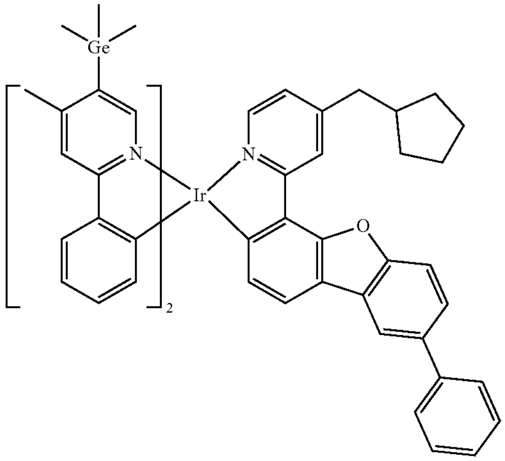
-continued
1769
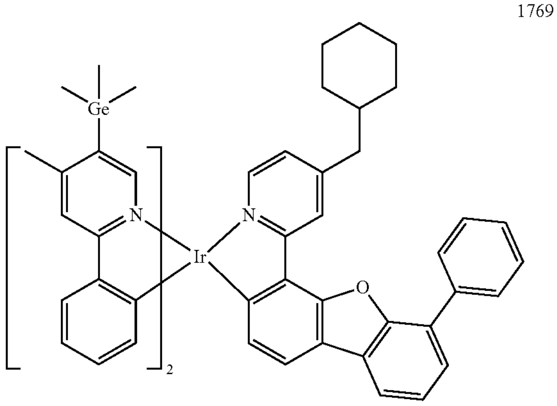
1770
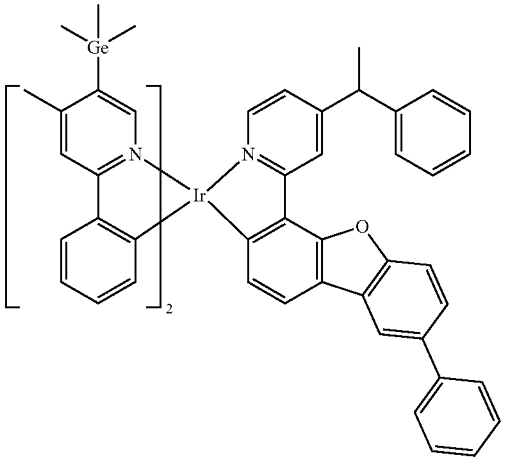
1771
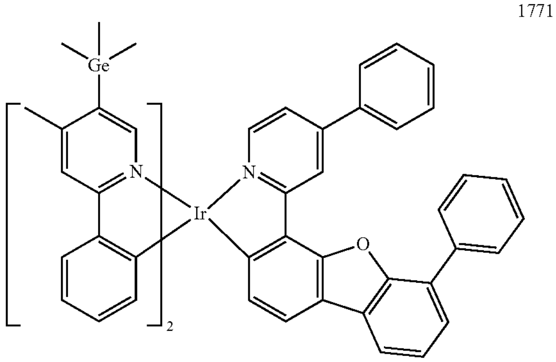

1772
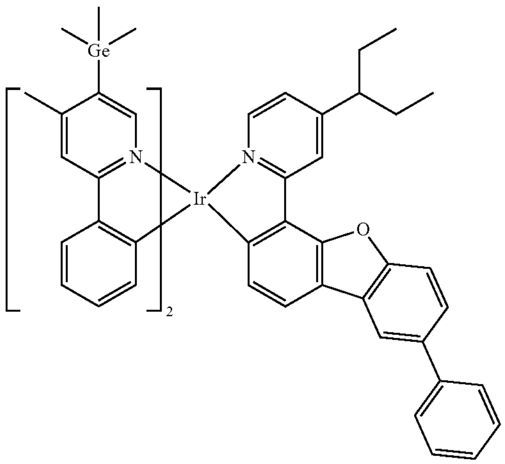
1773
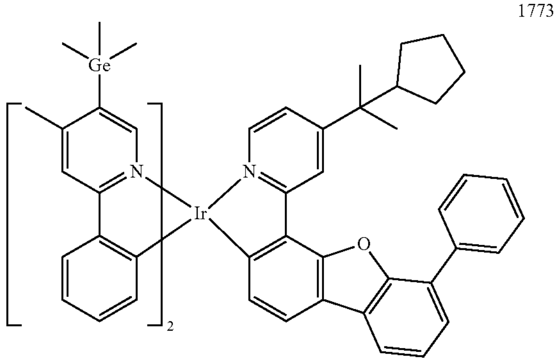
1774
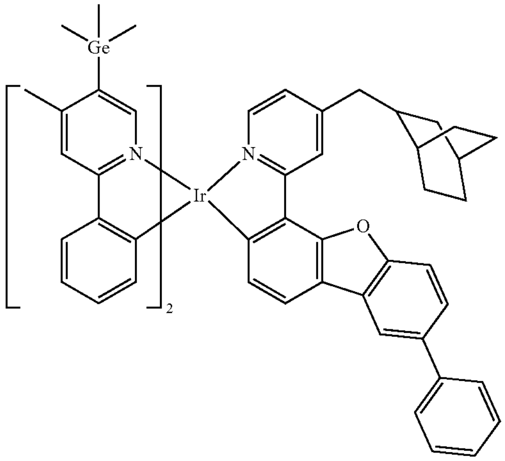
1775
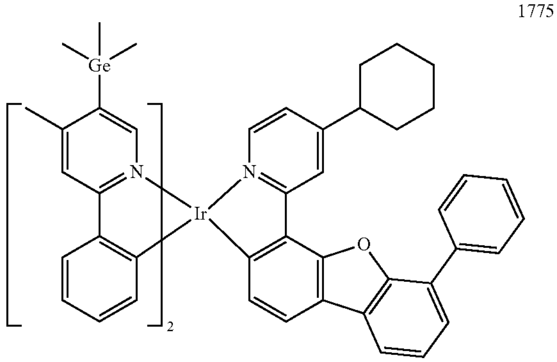
1776
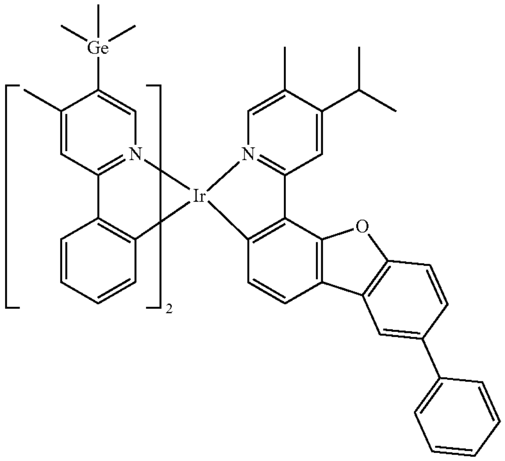
1777
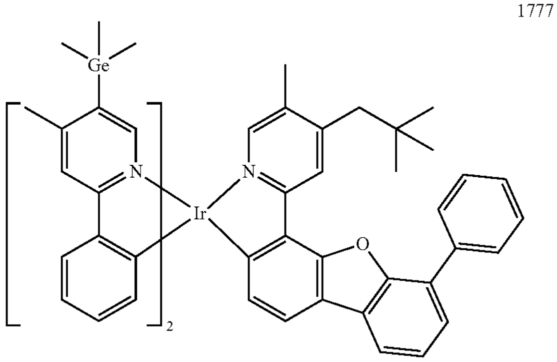
1778
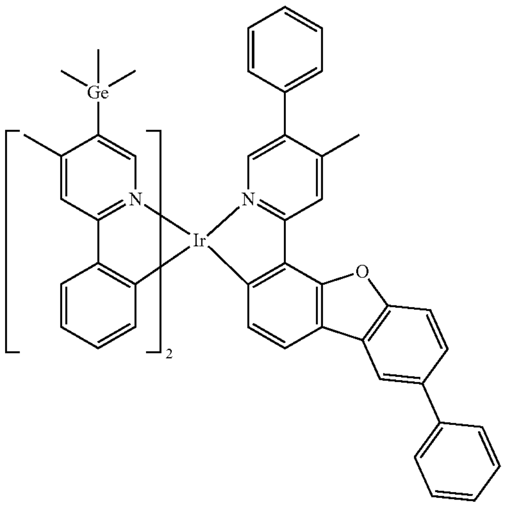

-continued
1779
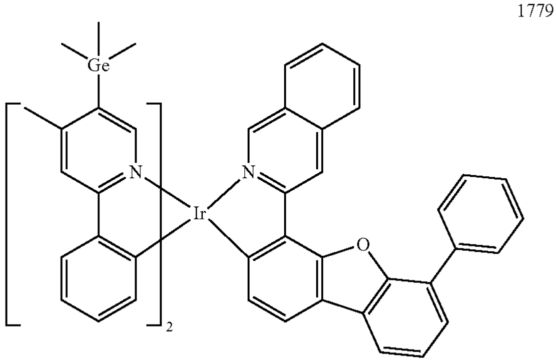
1780
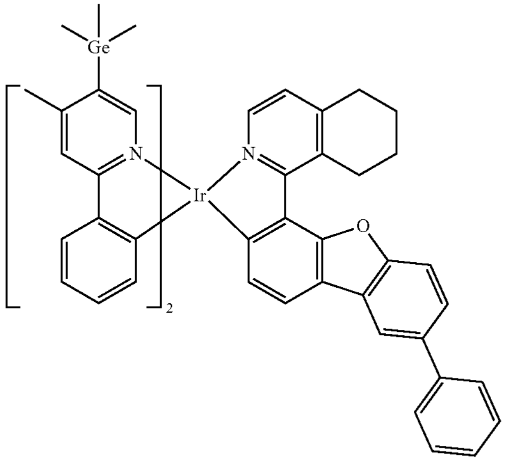
1781
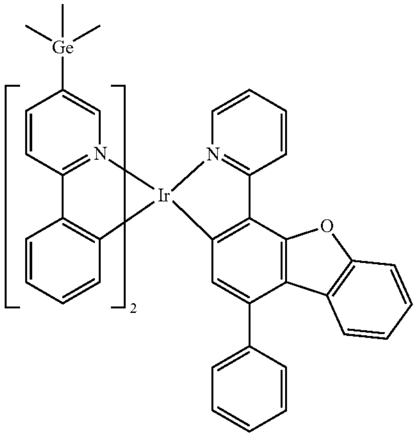
-continued
1782
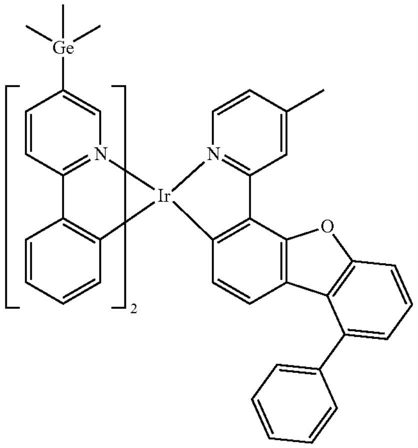
1783
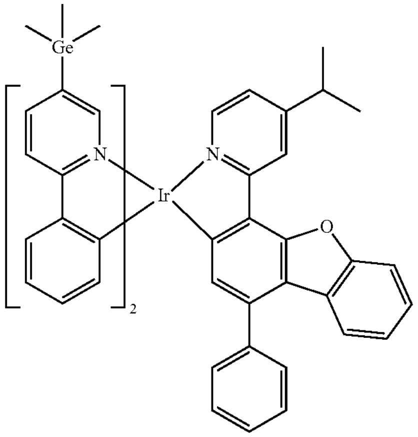
1784
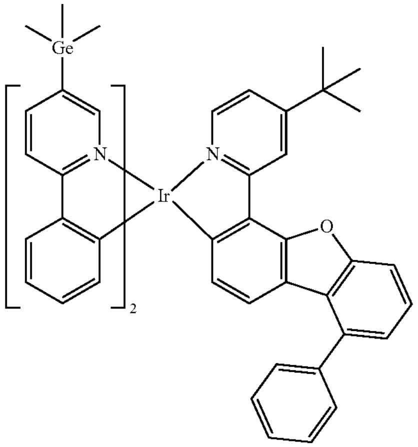

-continued
1785
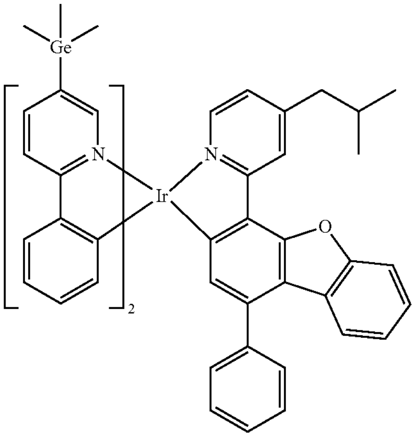
1786
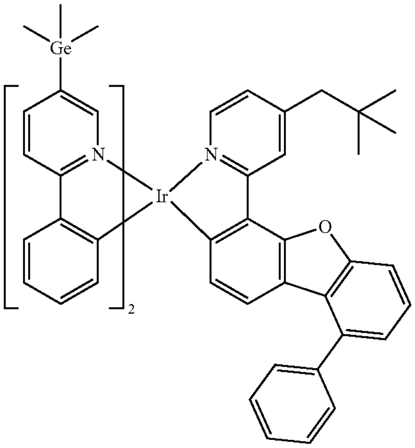
1787
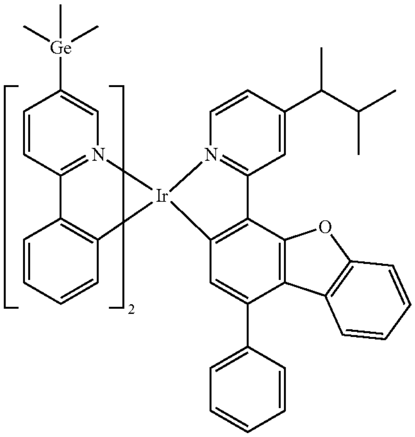
-continued
1788
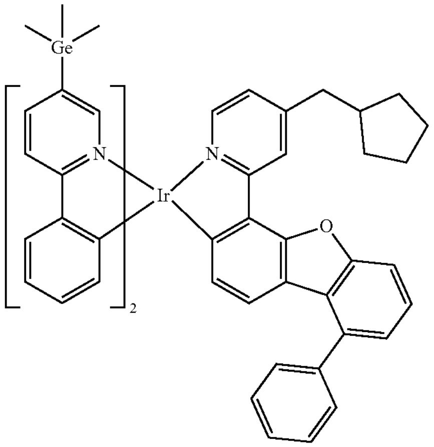
1789
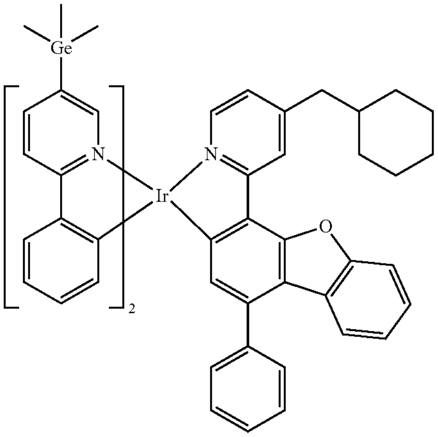
1790
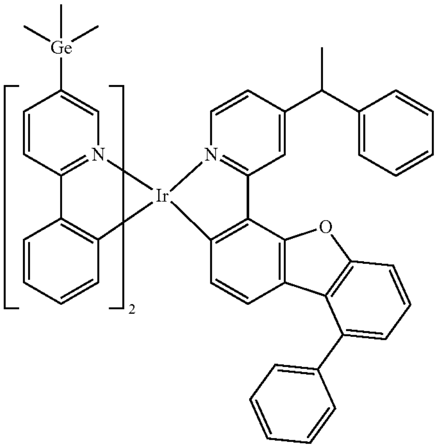

-continued
1791
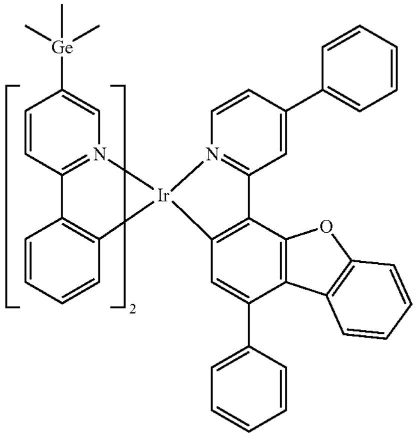
1792
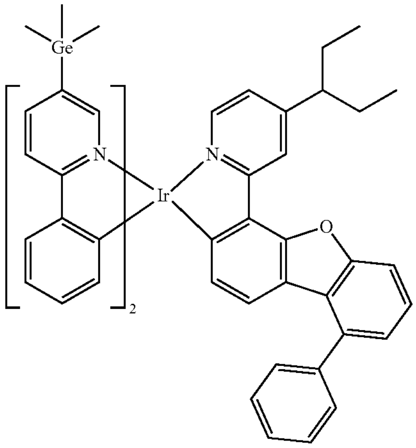
1793
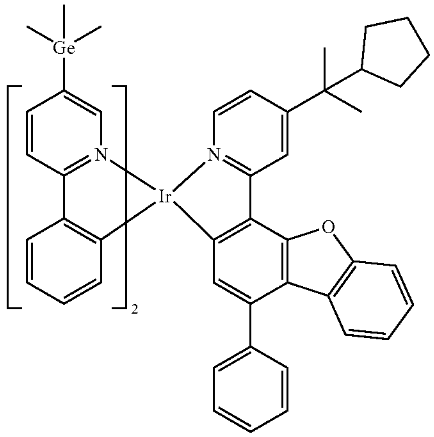
-continued
1794
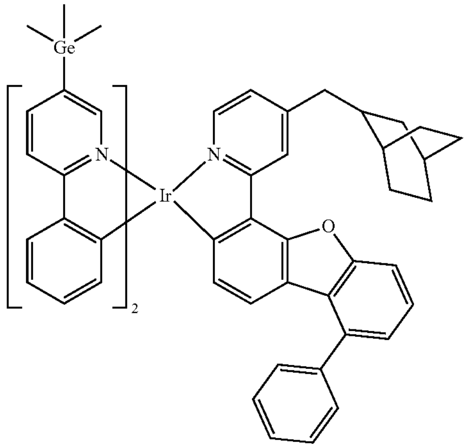
1795
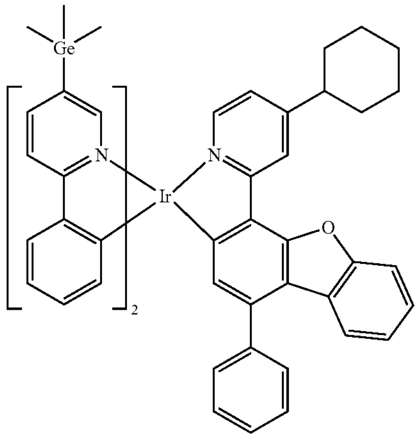
1796
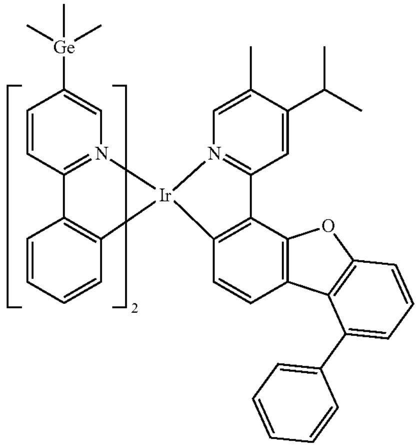

-continued
1797
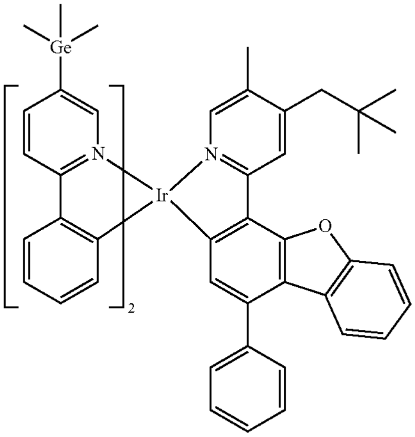
1798
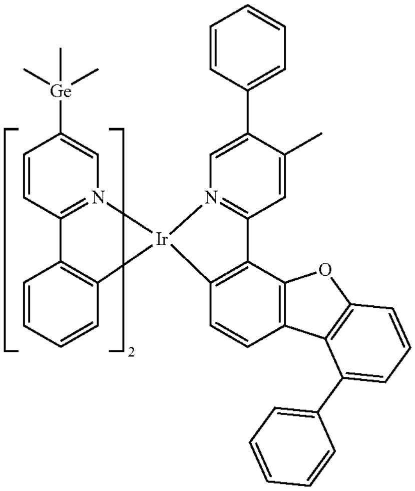
1799
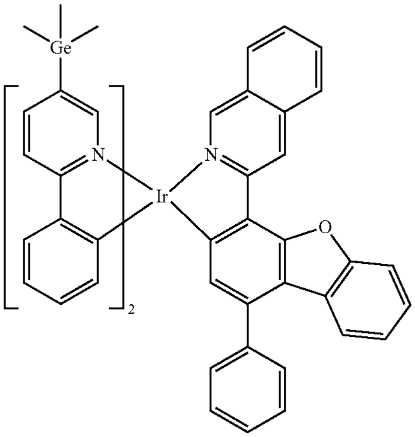
-continued
1800
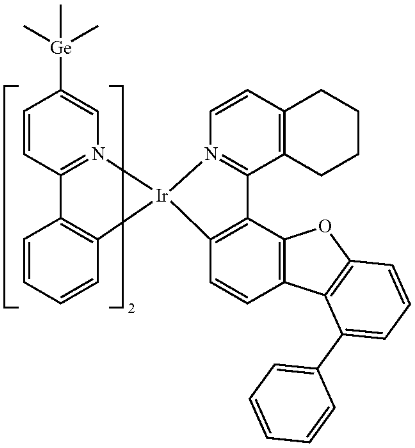
1801
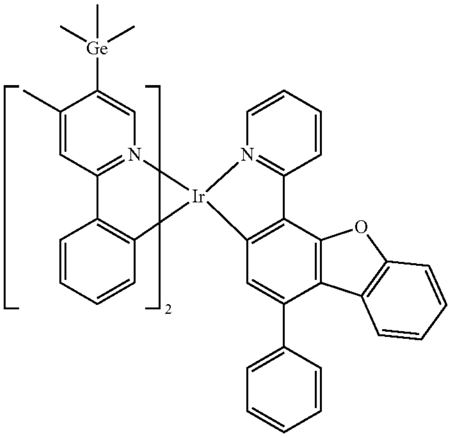
1802
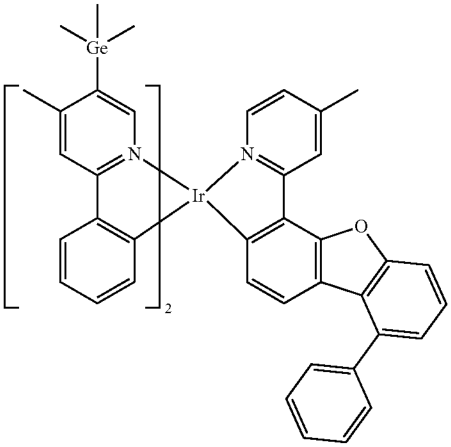

-continued
1803
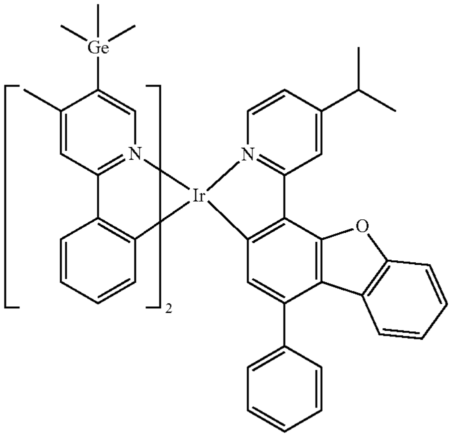
1804
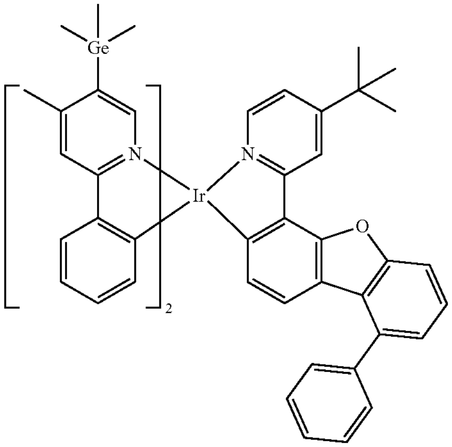
1805
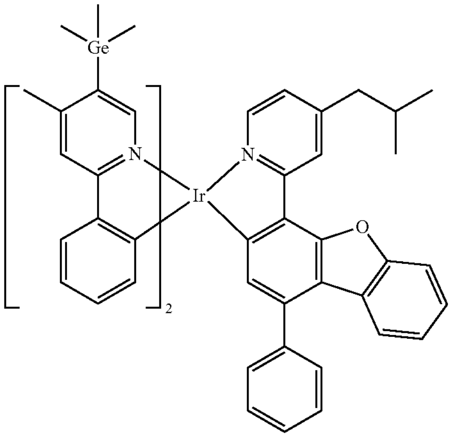
-continued
1806
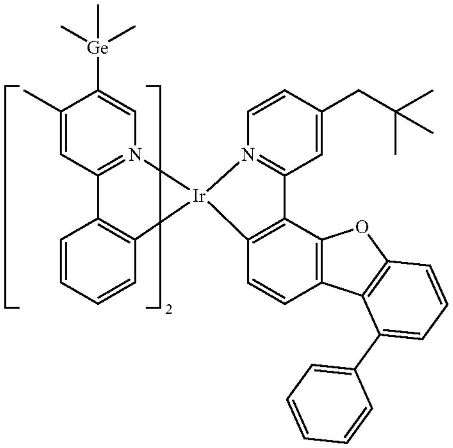
1807
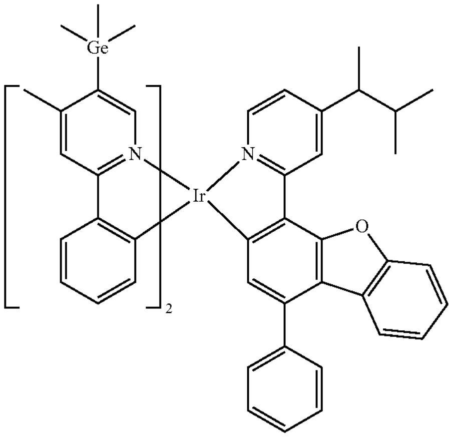
1808
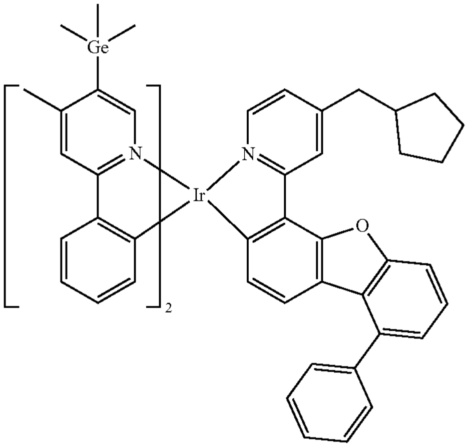

-continued
1809
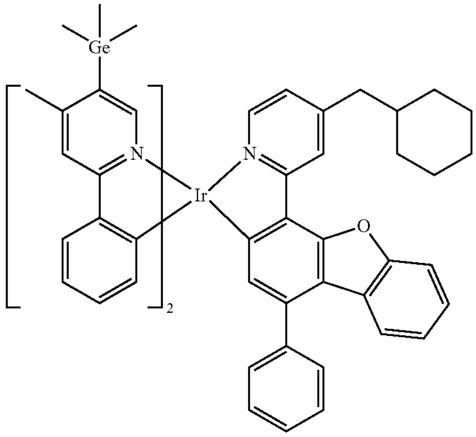
1810
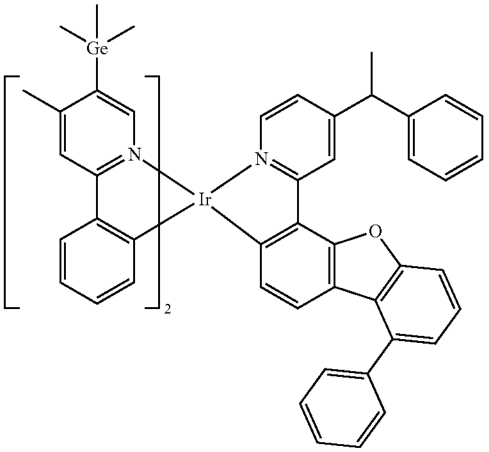
1811
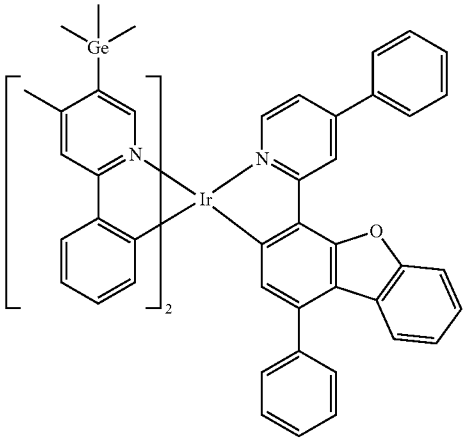
-continued
1812
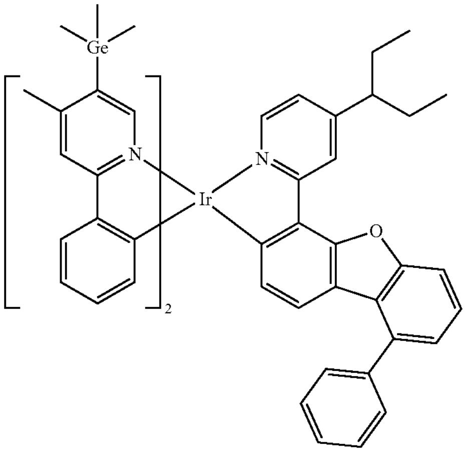
1813
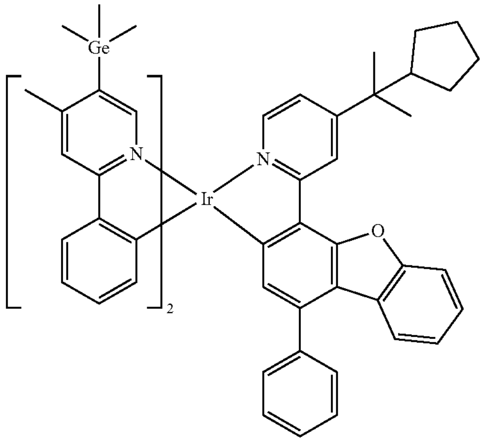
1814
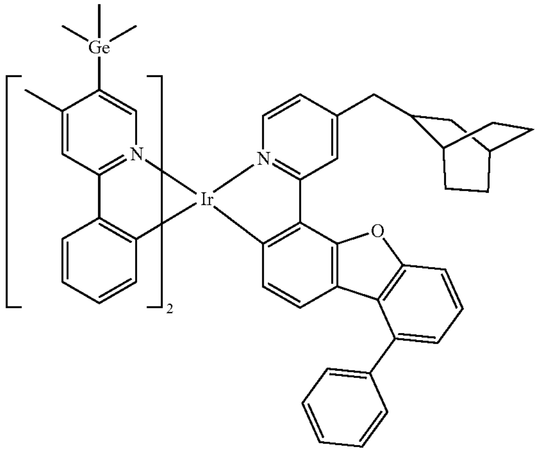

-continued
1815
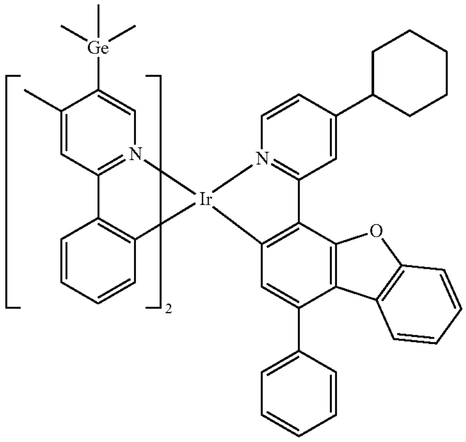
1816
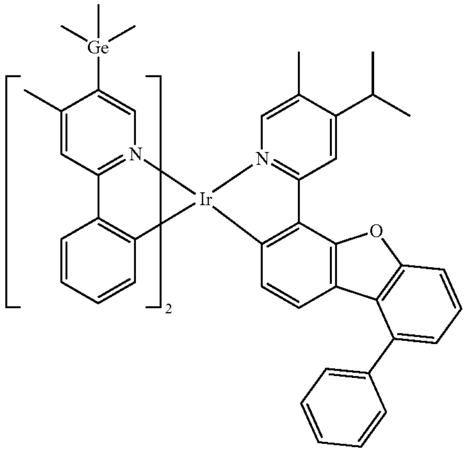
1817
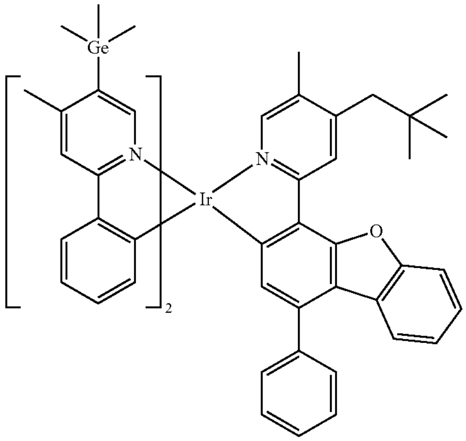
-continued
1818
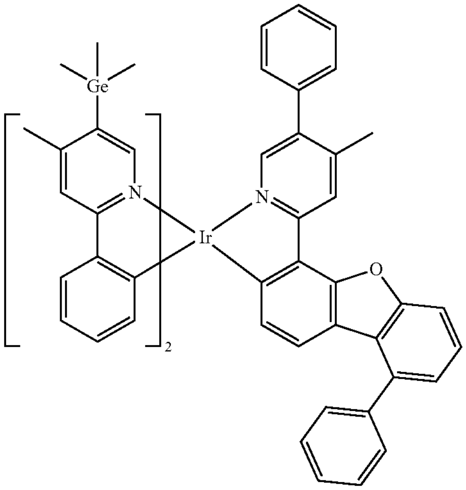
1819
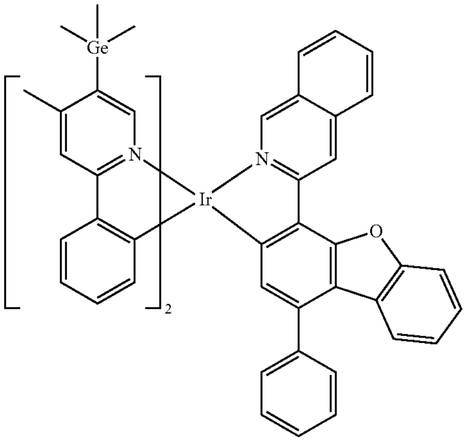
1820
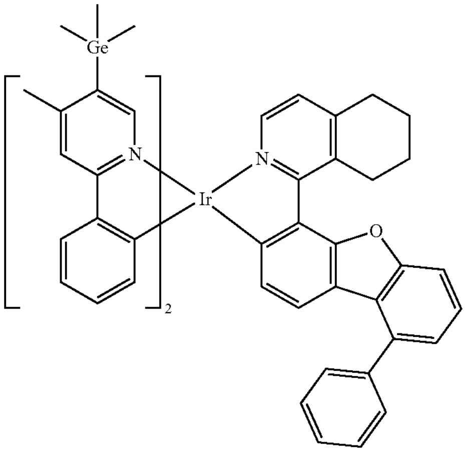

1821
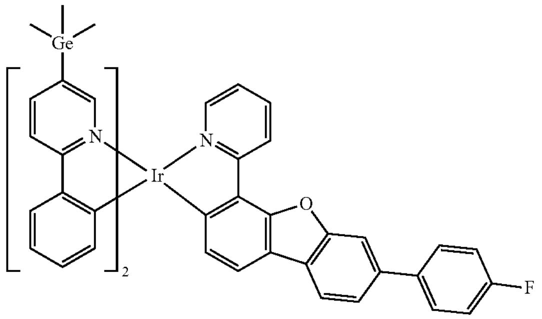
1822
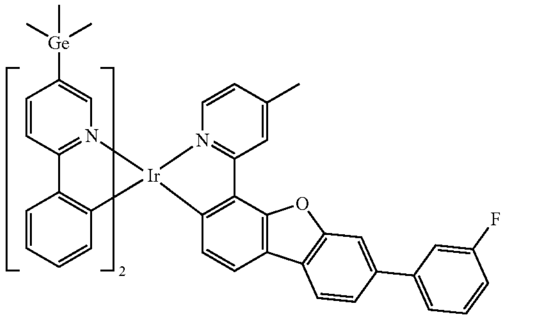
1823
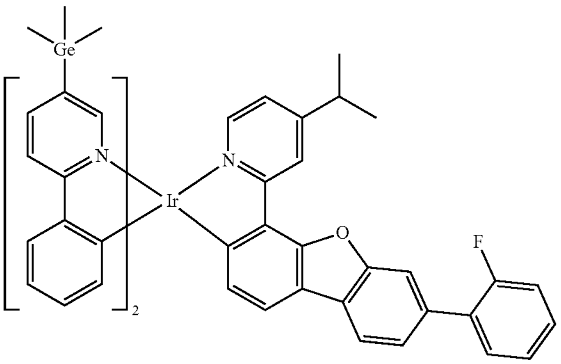
1824
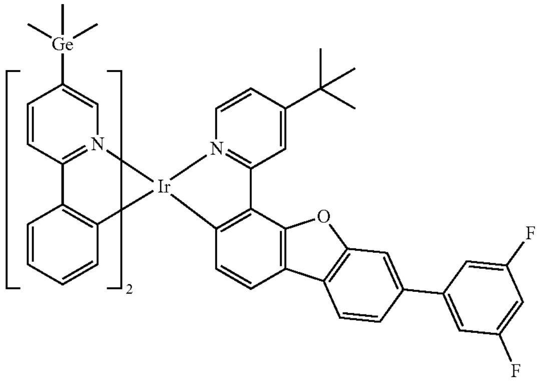
1825
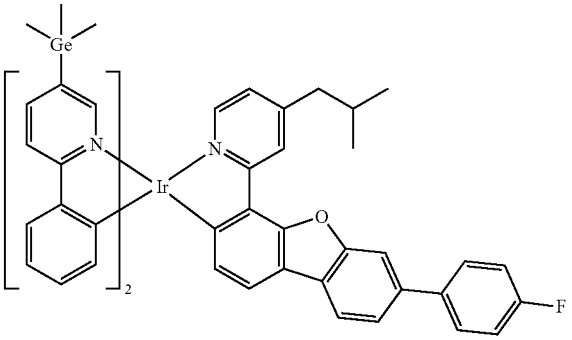
1826
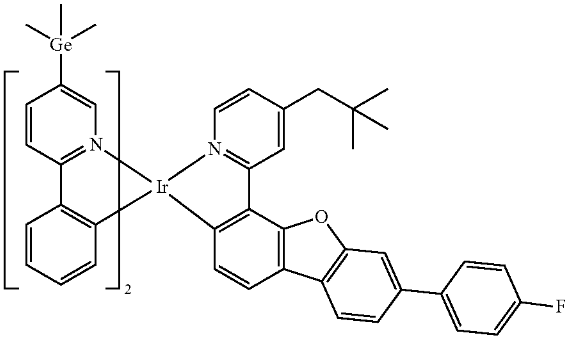
1827
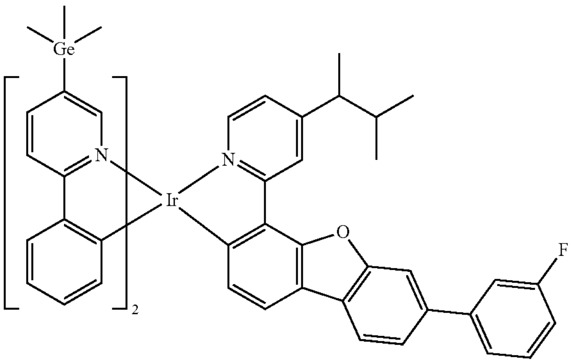
1828
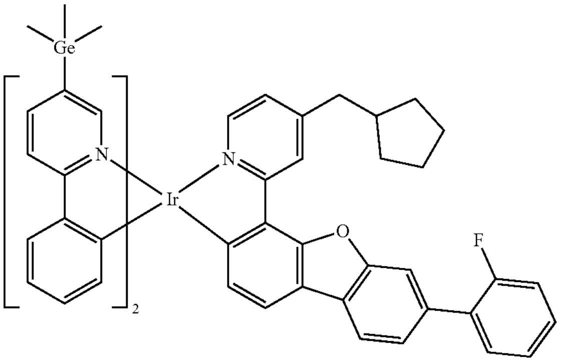

-continued
1829
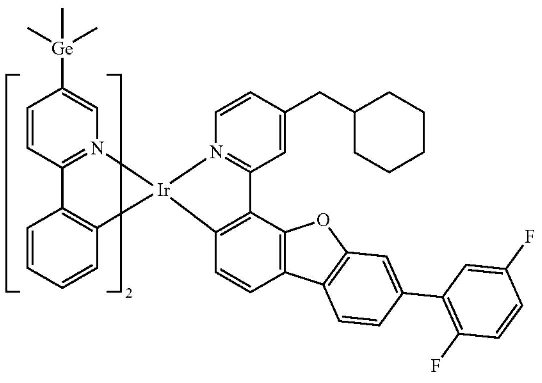
1830
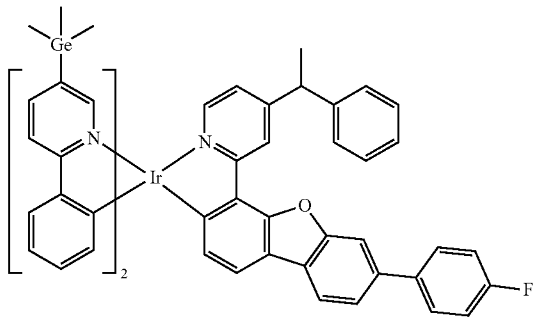
1831
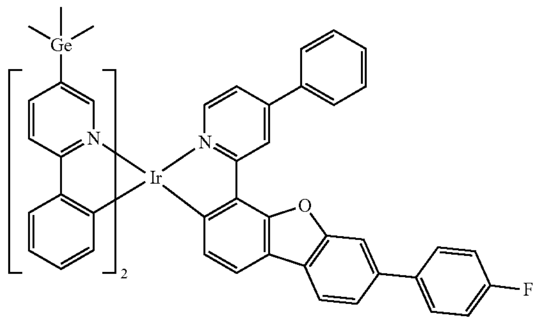
1832
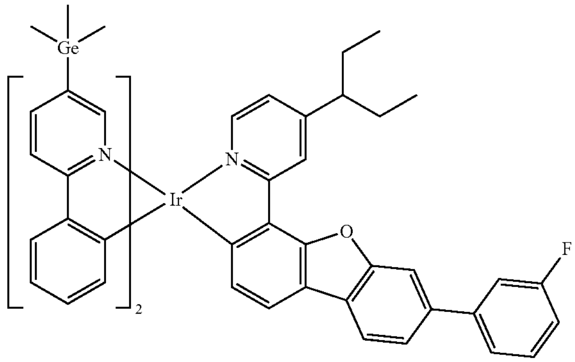
-continued
1833
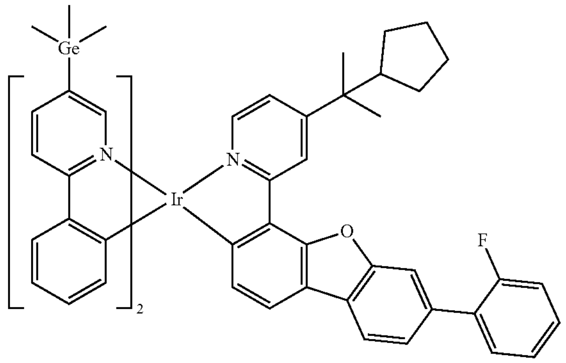
1834
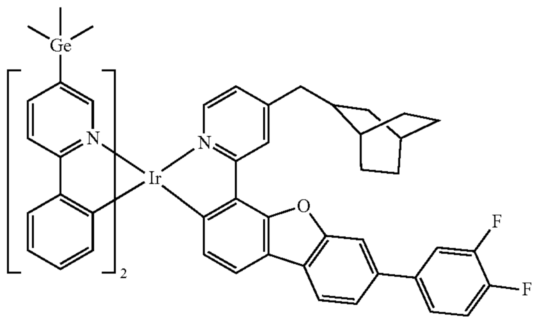
1835
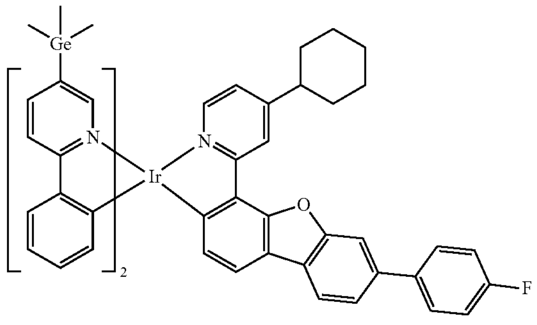
1836
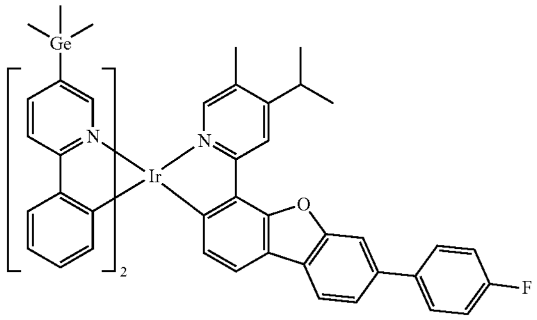

-continued
1837
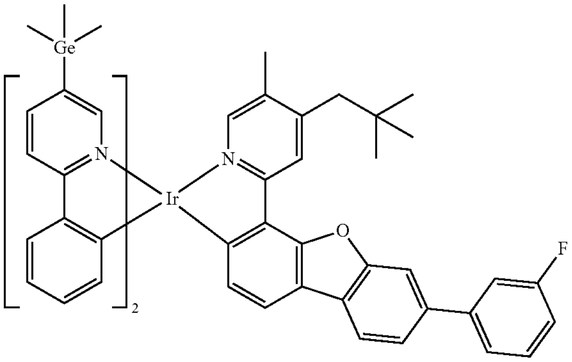
1838
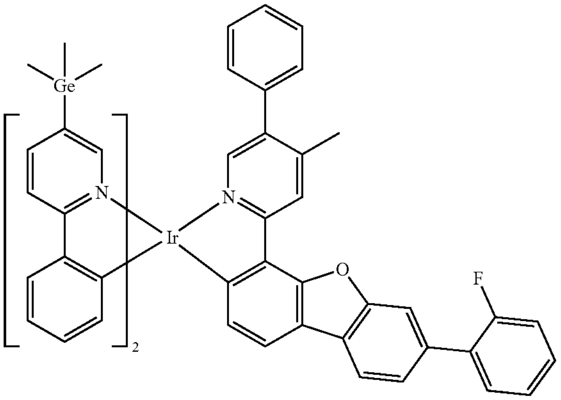
1839
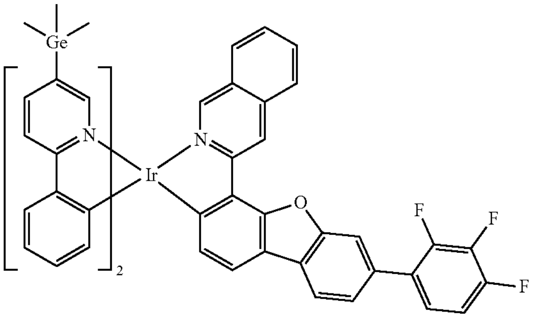
1840
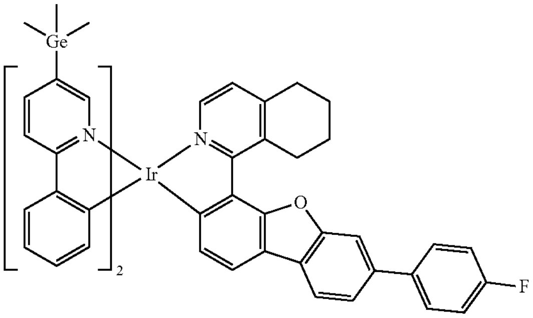
-continued
1841
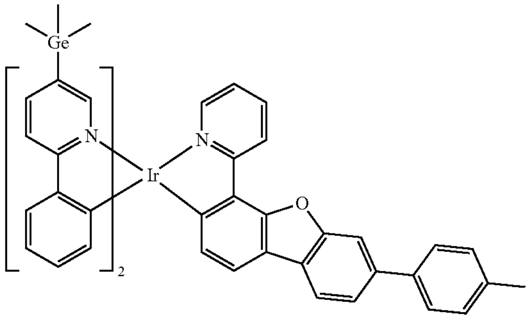
1842
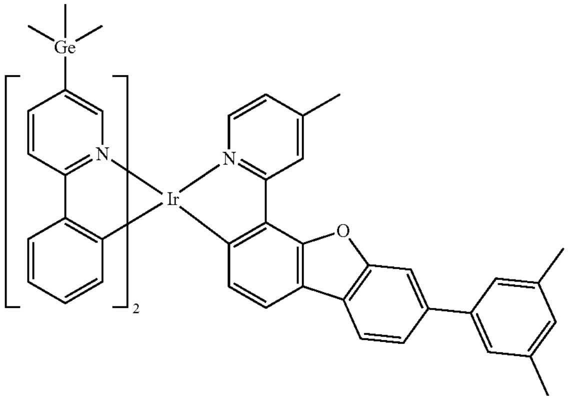
1843
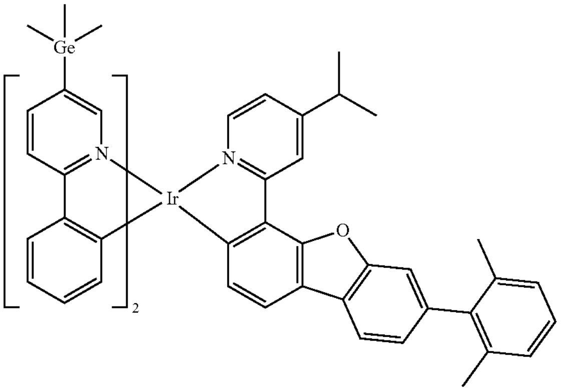
1844
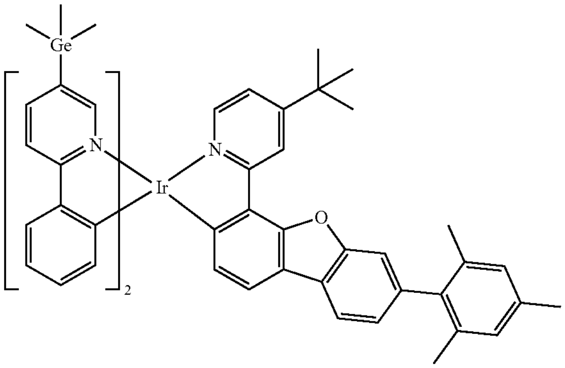

-continued
1845
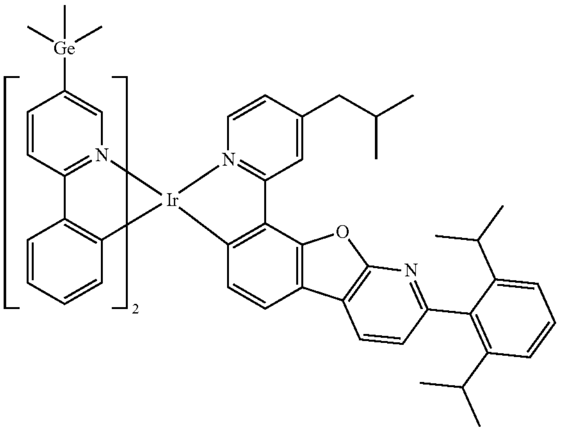
1846
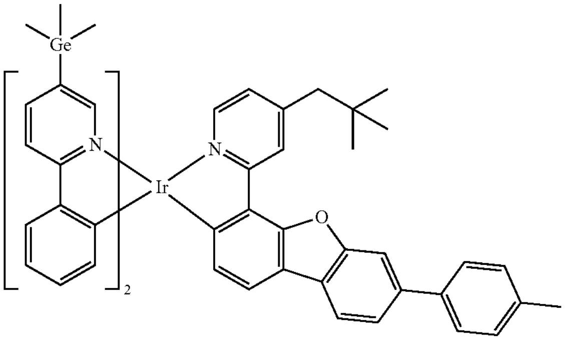
1847
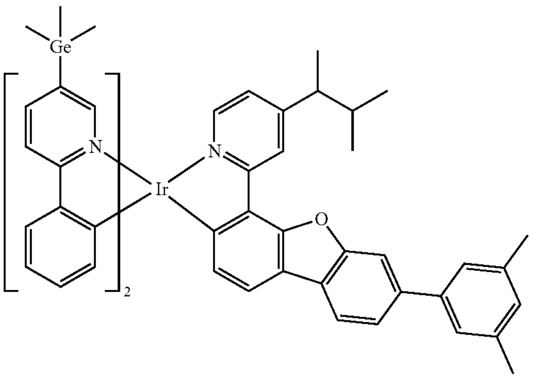
1848
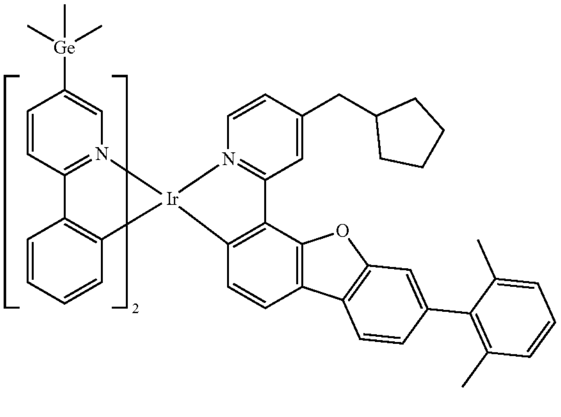
-continued
1849
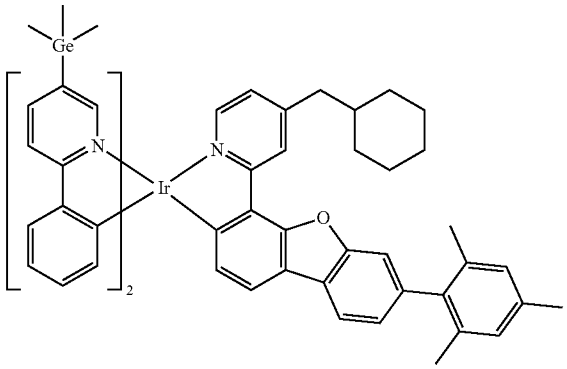
1850
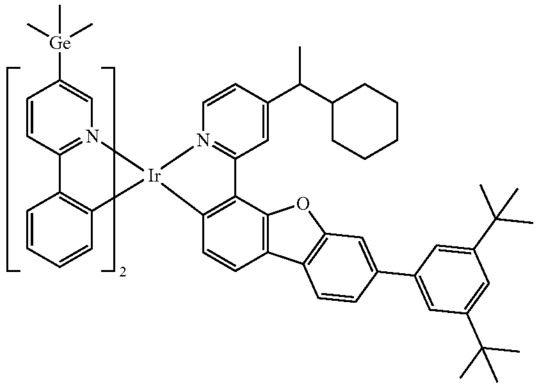
1851
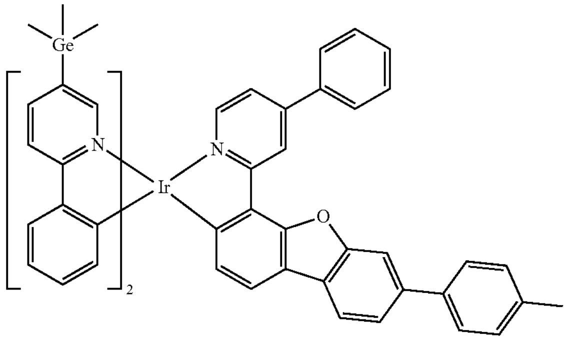
1852
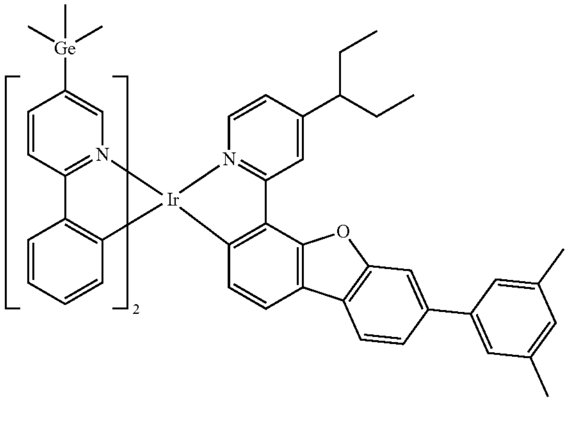

1853
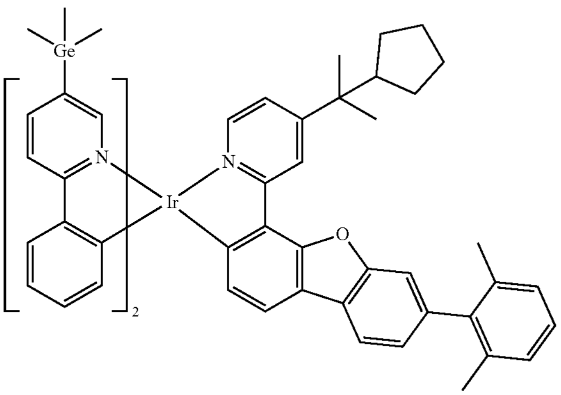
1854
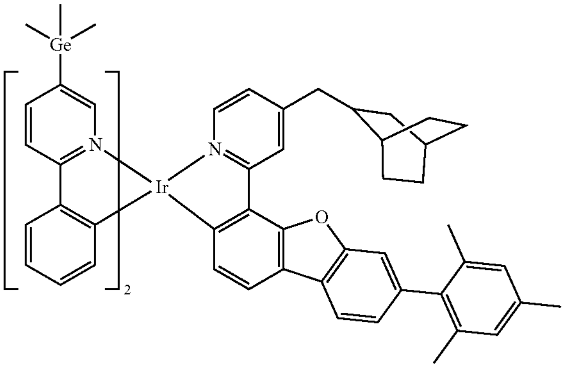
1855
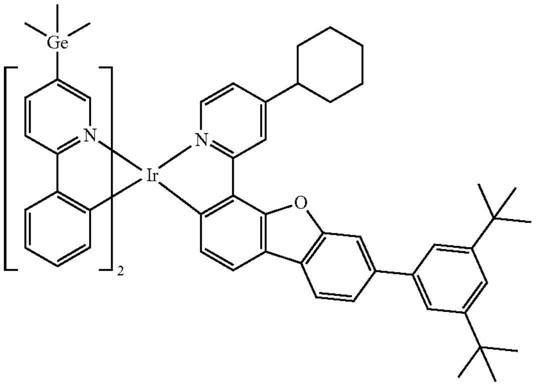
1856
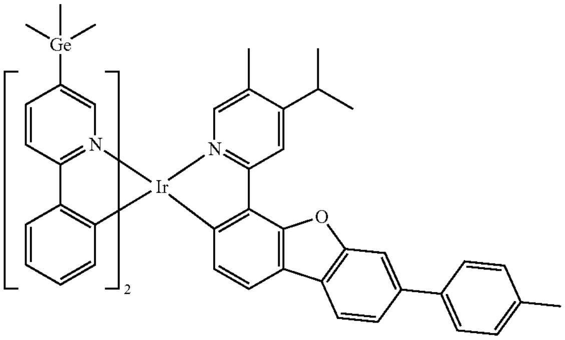
-continued
1857
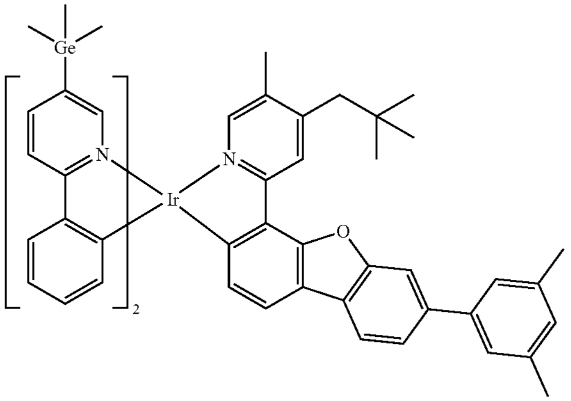
1858
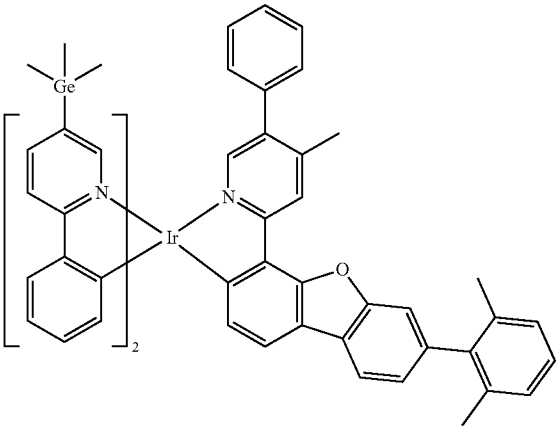
1859
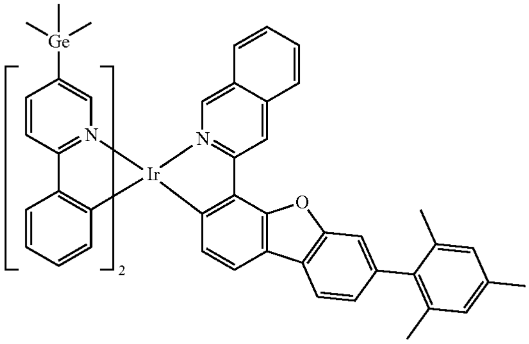
1860
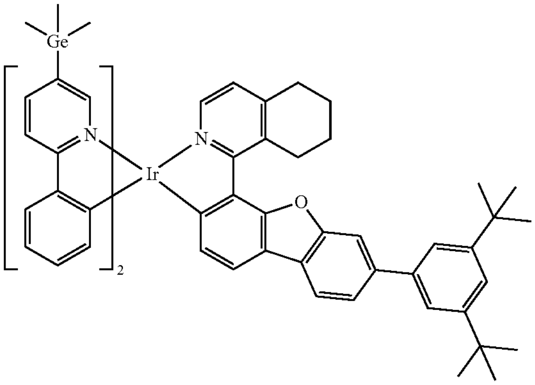

-continued
1861
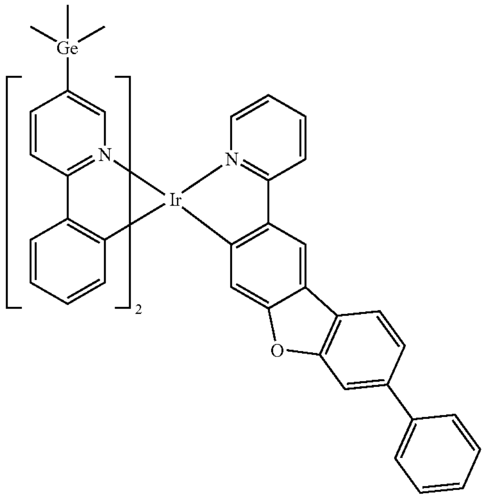
1862
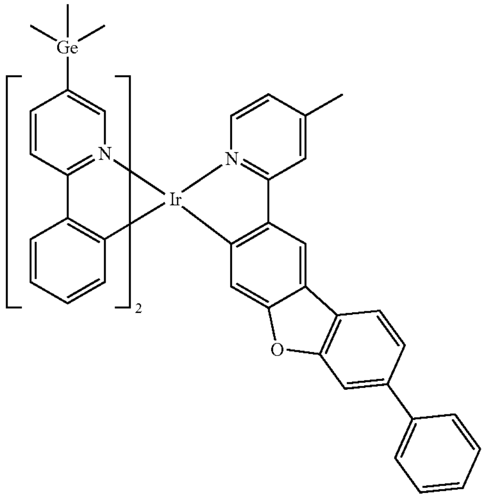
1863
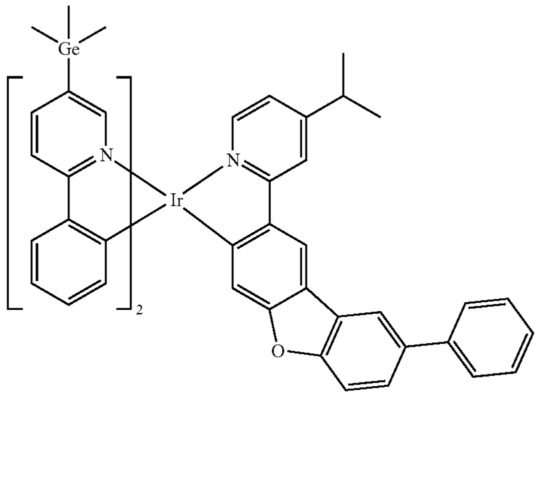
-continued
1864
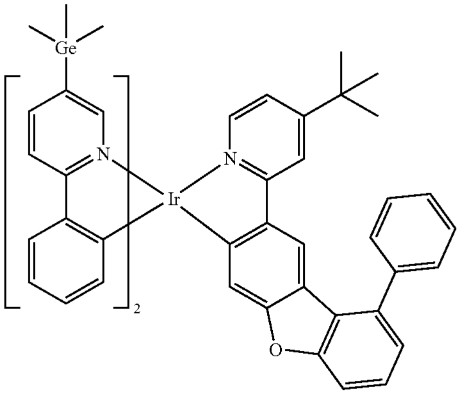
1865
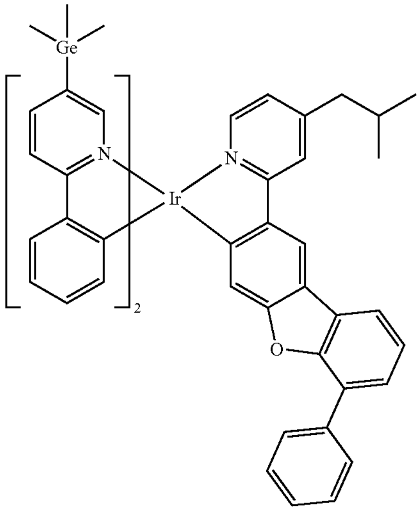
1866
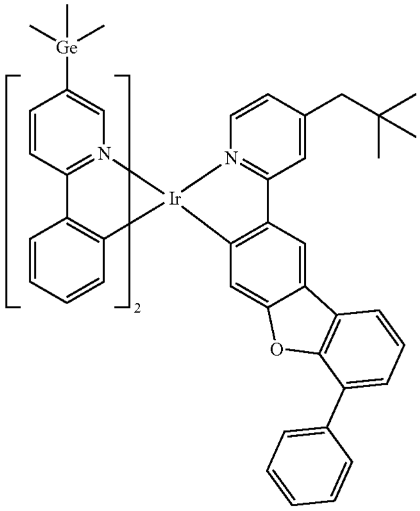

1867
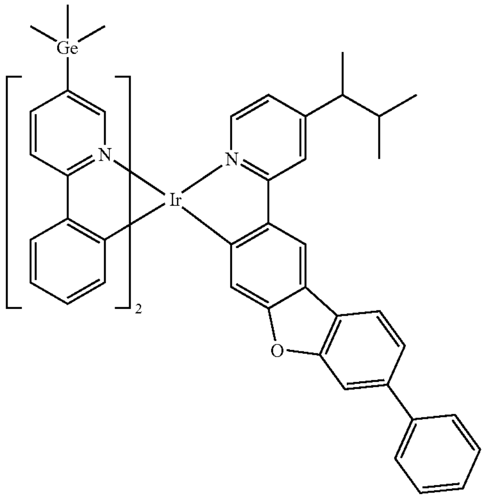
1868
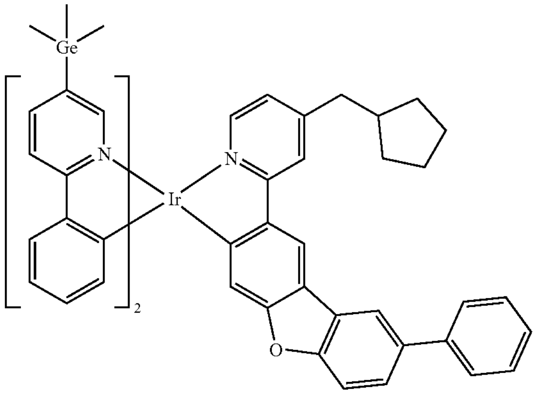
1869
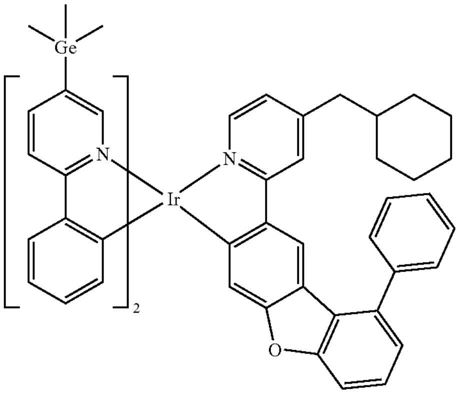
1870
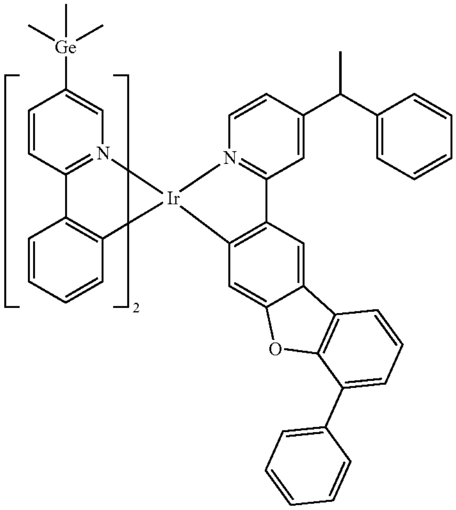
1871
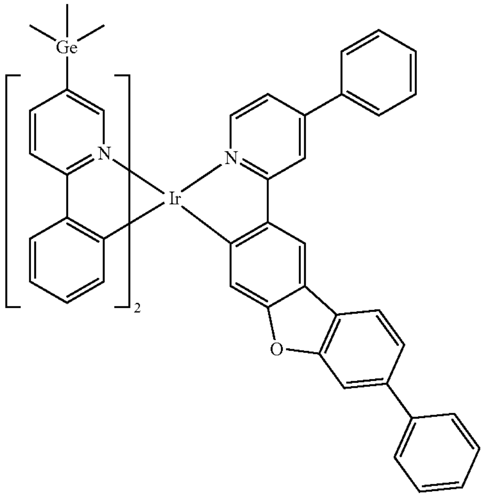
1872
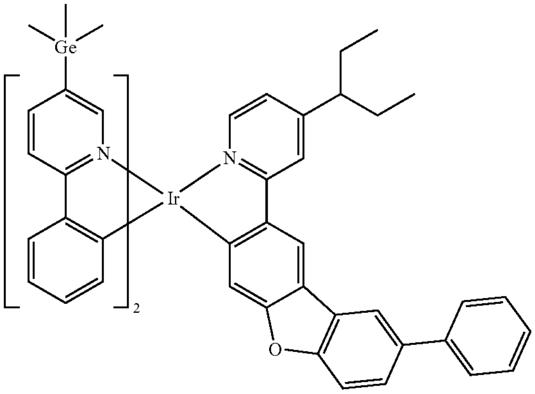

-continued
1873
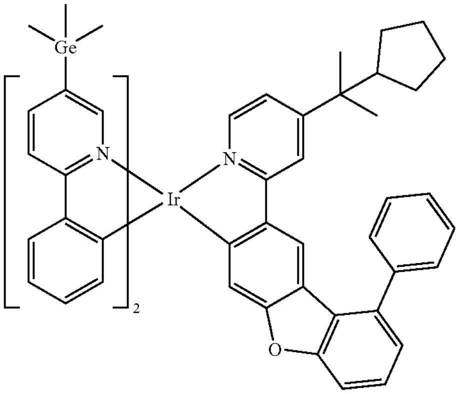
1874
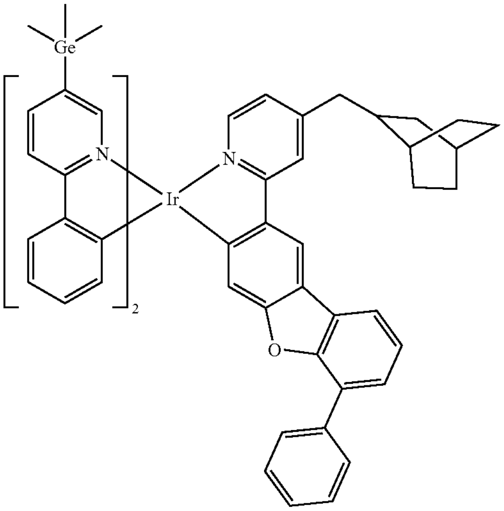
1875
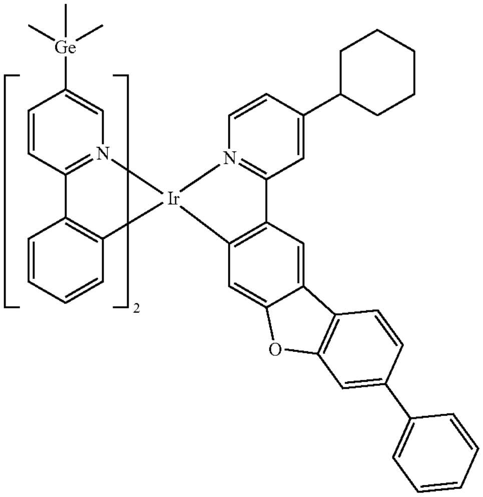
-continued
1876
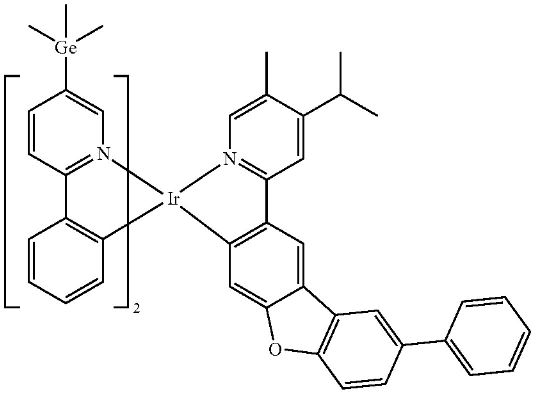
1877
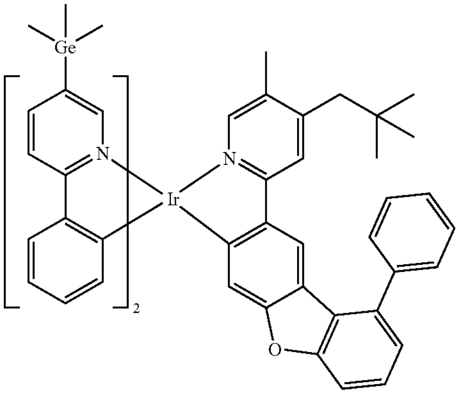
1878
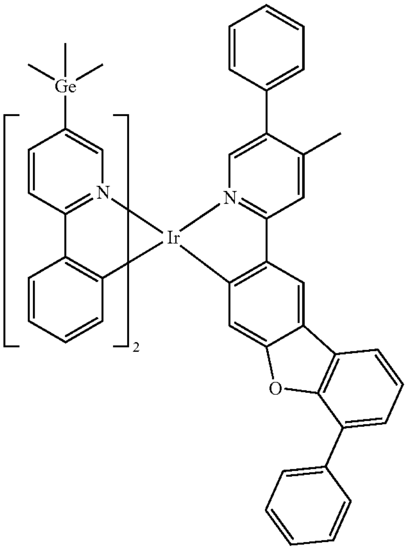

-continued
1879
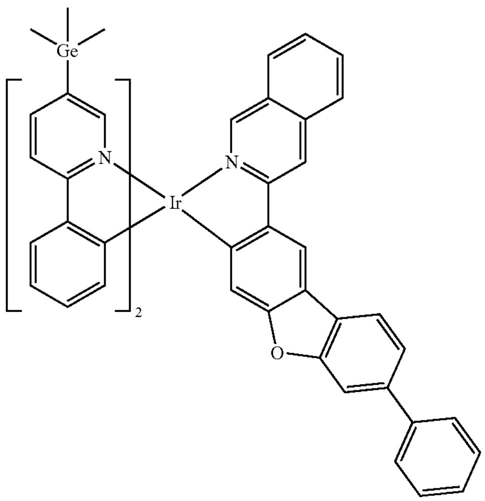
1880
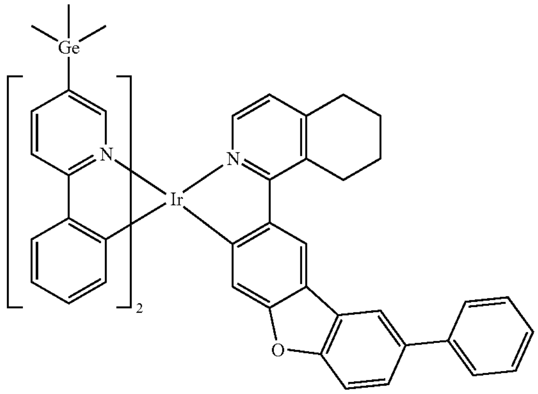
1881
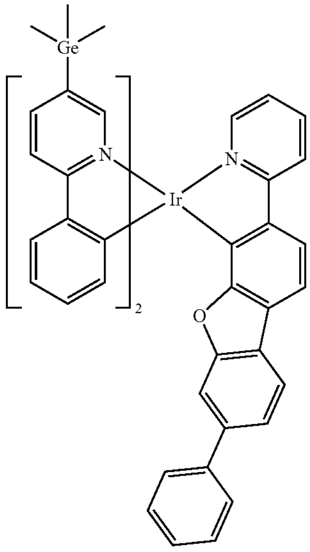
-continued
1882
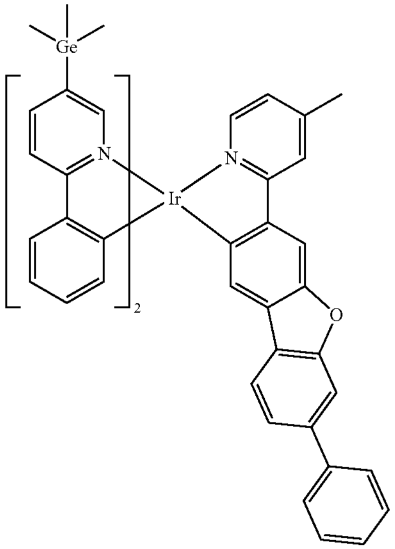
1883
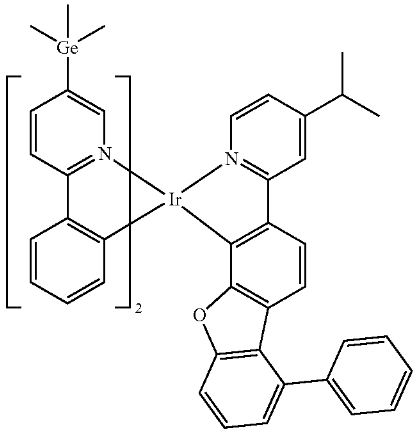
1884
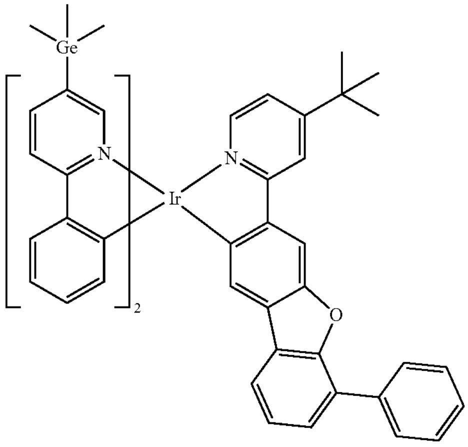

-continued
1885
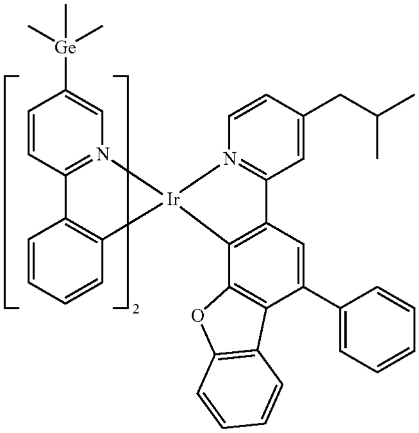
1886
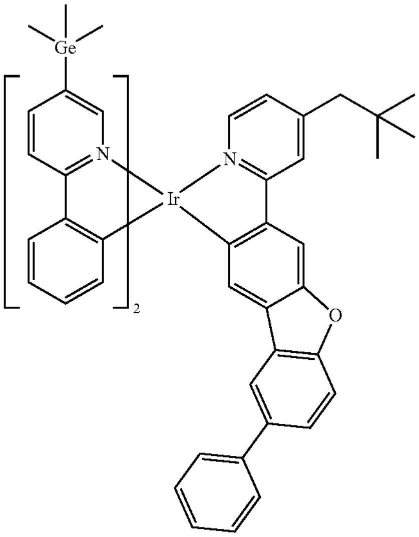
1887
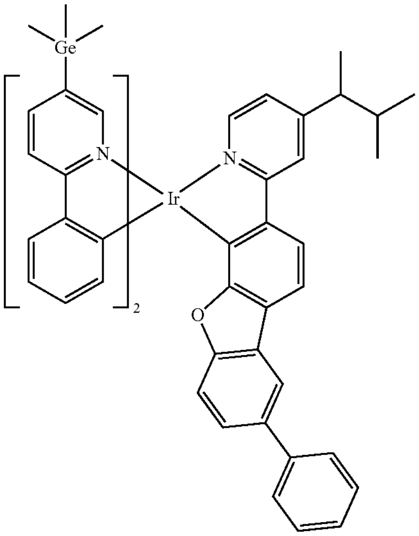
-continued
1888
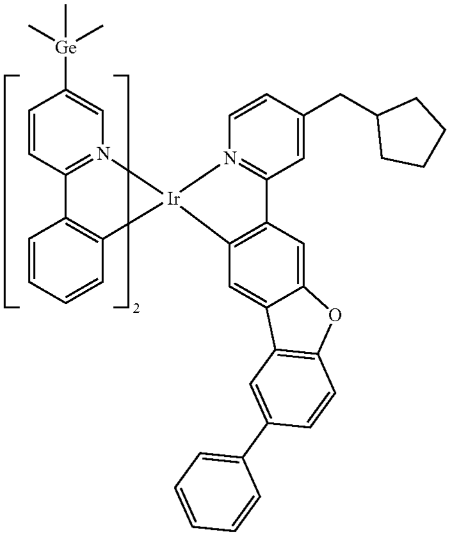
1889
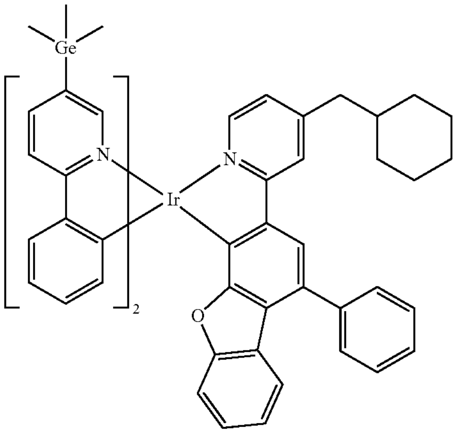
1890
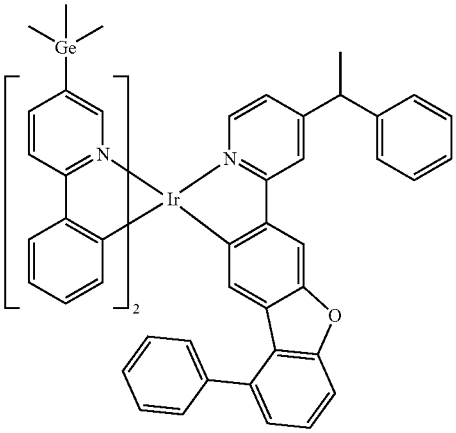

-continued
1891
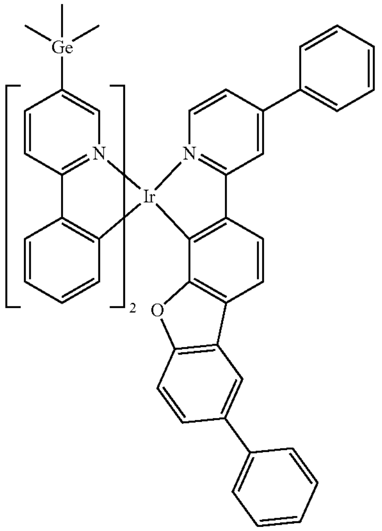
1892
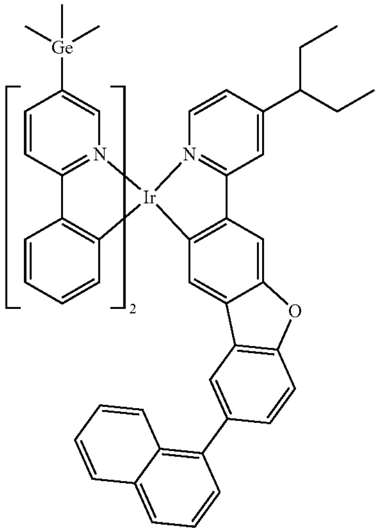
1893
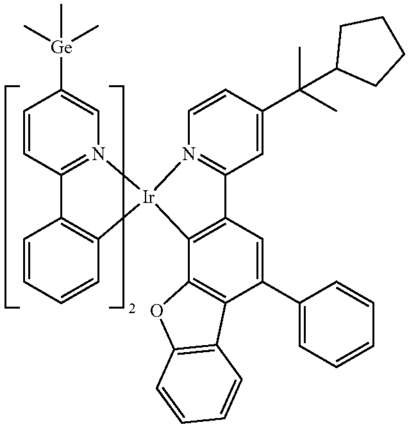
1894
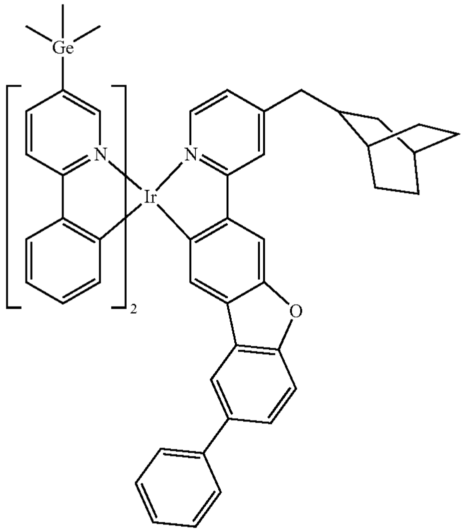
1895
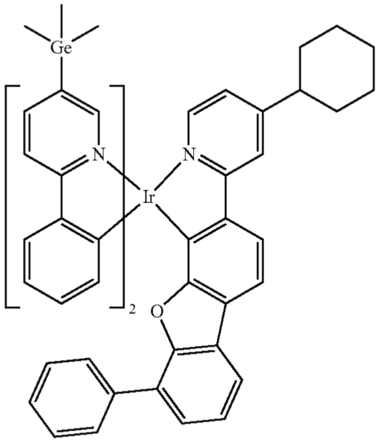
1896
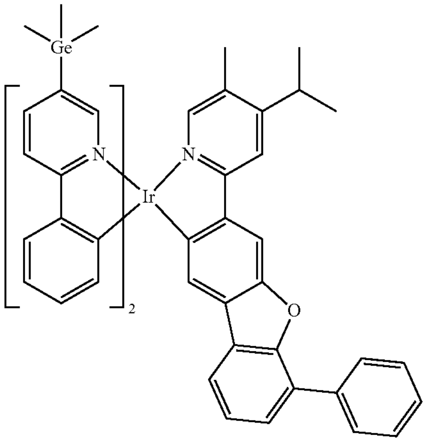

-continued
1897
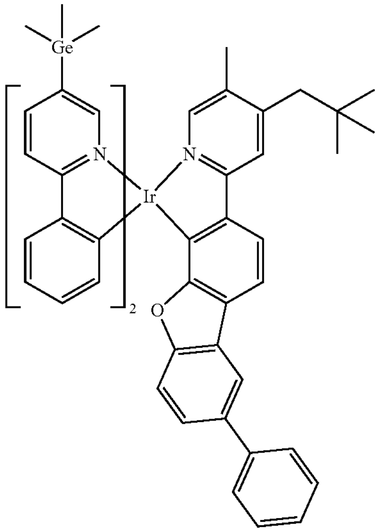
1898
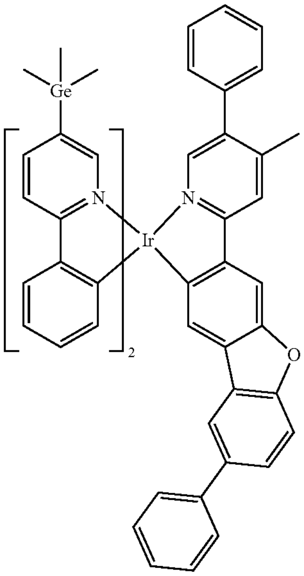
1899
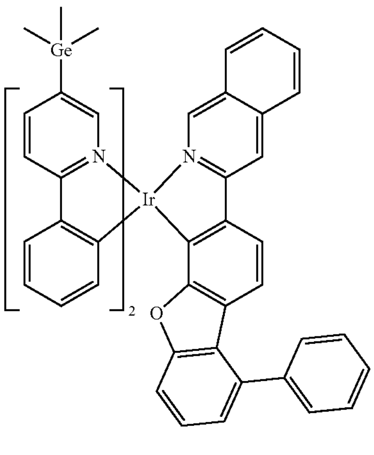
-continued
1900
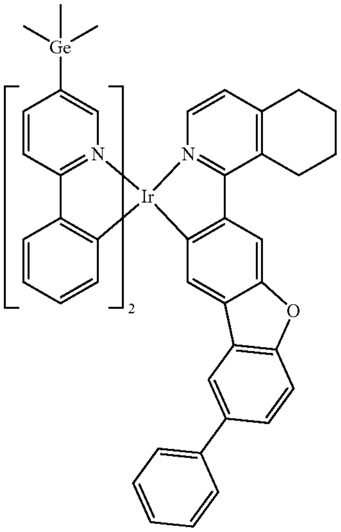
1901
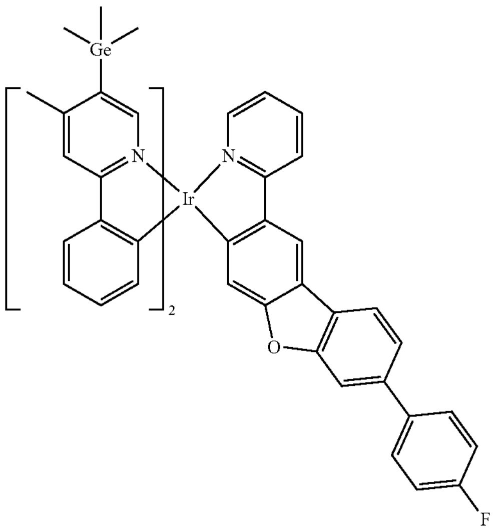
1902
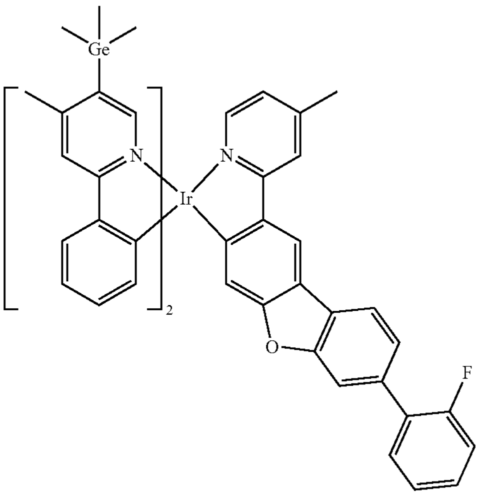

-continued
1903
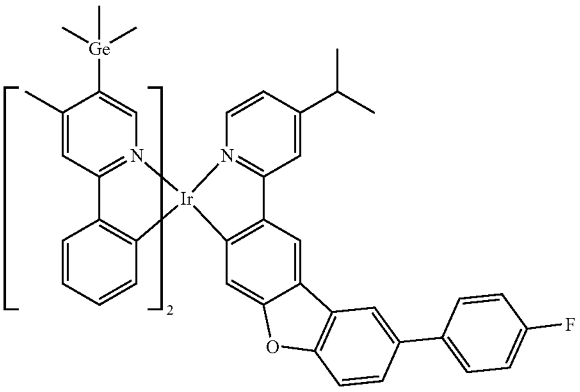
1904
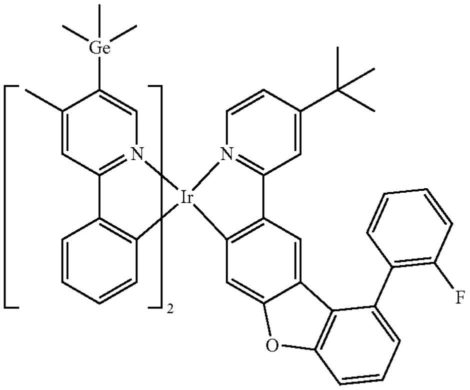
1905
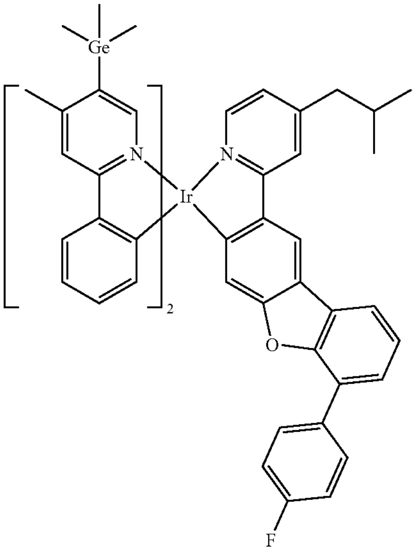
1906
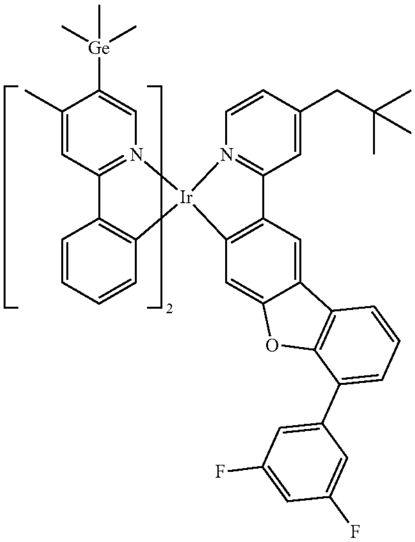
1907
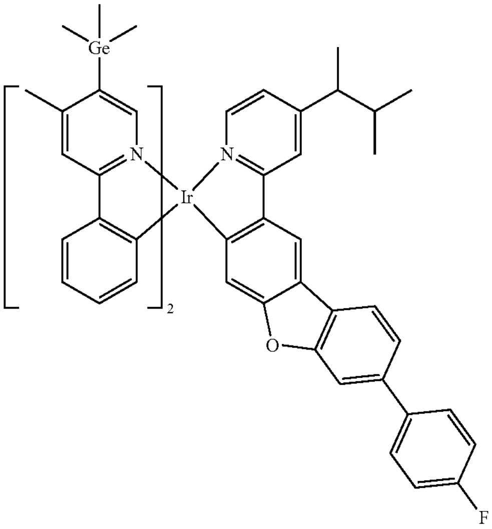
1908
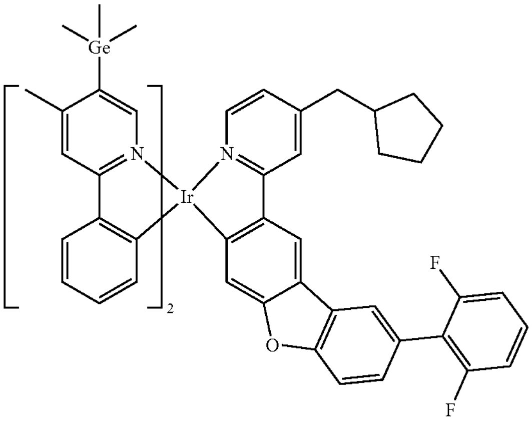

-continued
1909
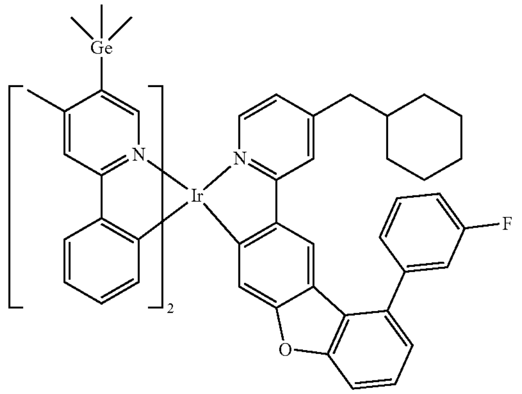
1910
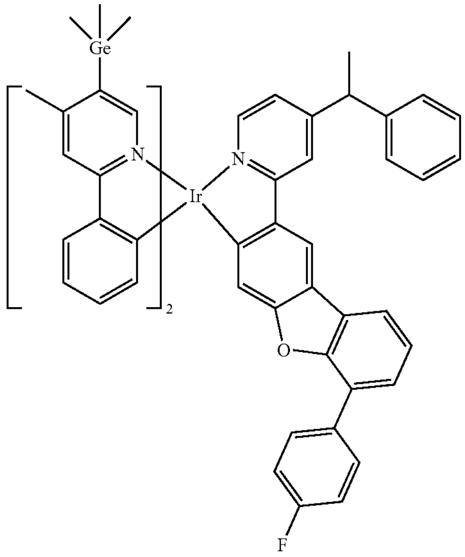
1911
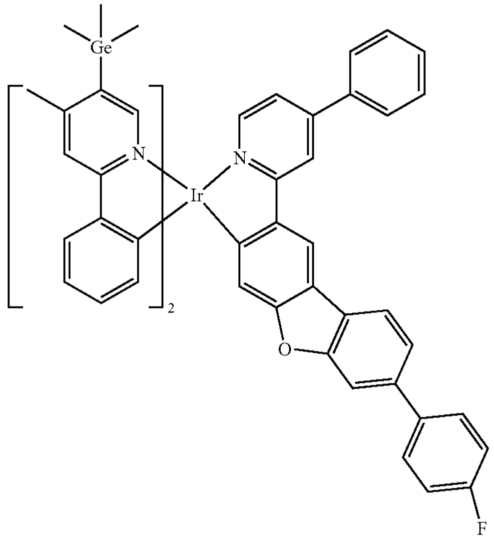
1912
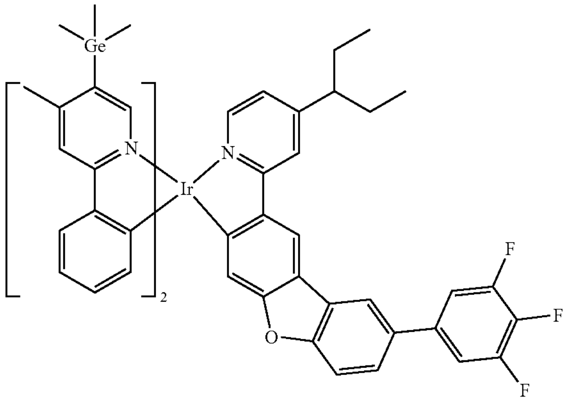
1913
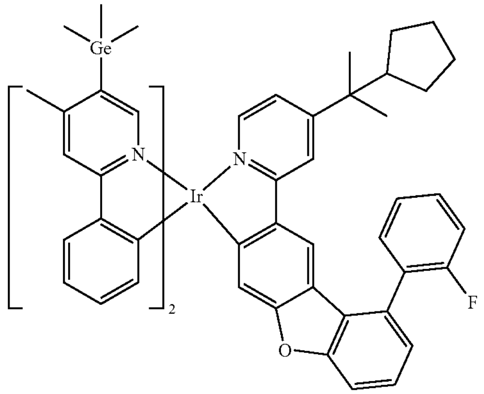
1914
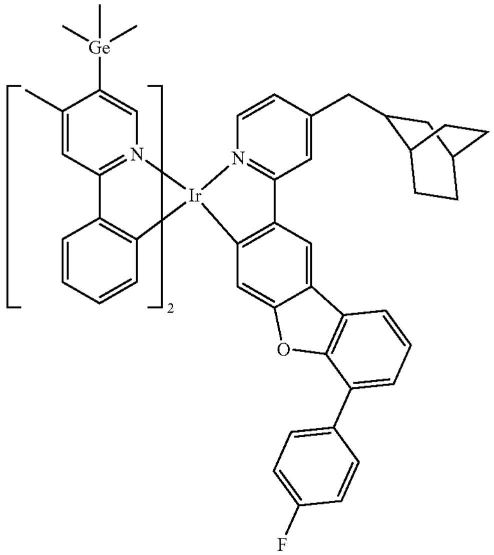

-continued
1915
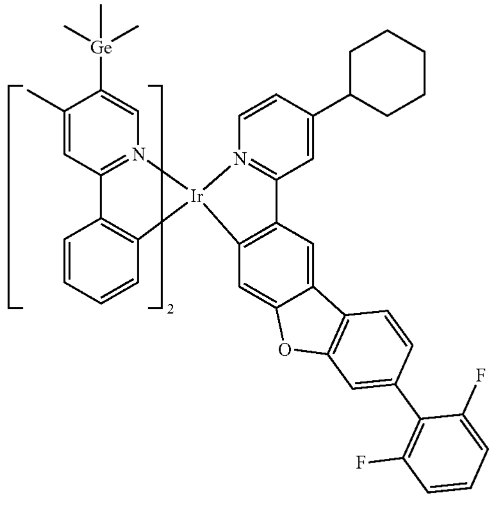
1916
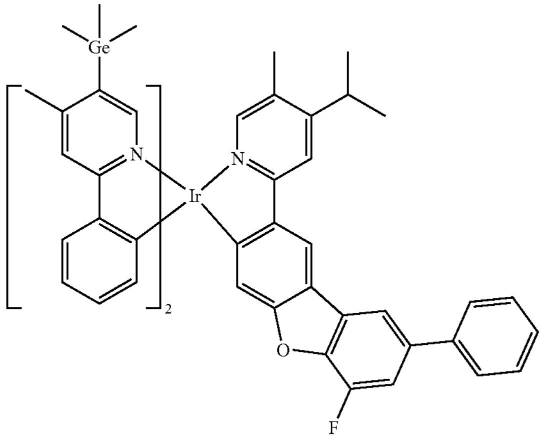
1917
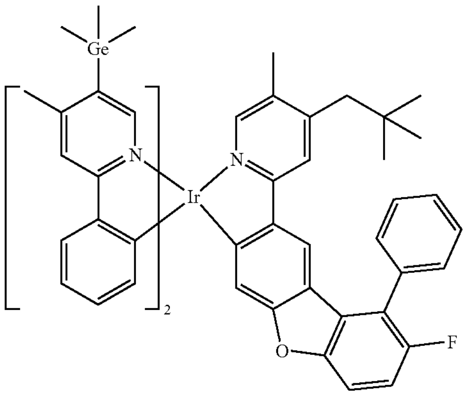
-continued
1918
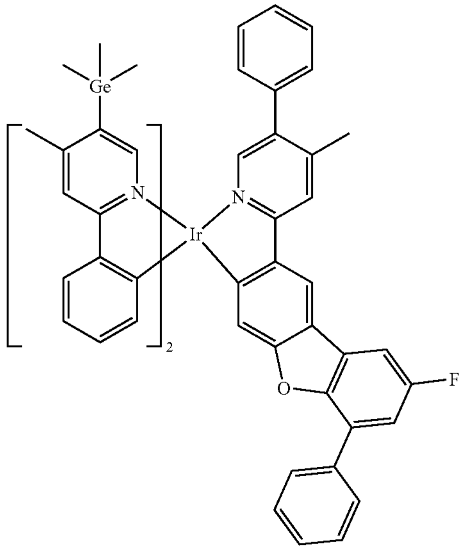
1919
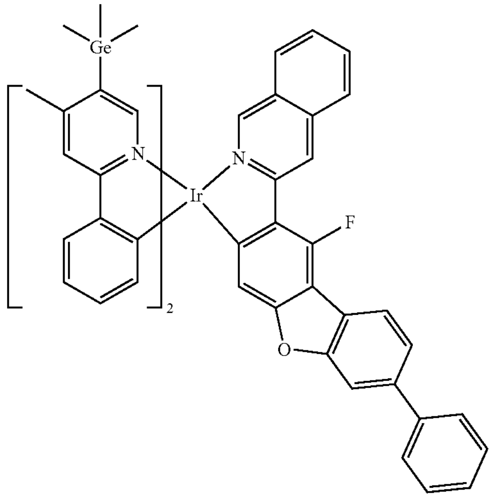
1920
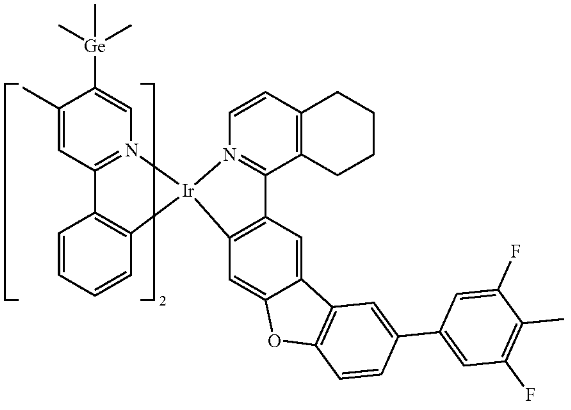

-continued
1921
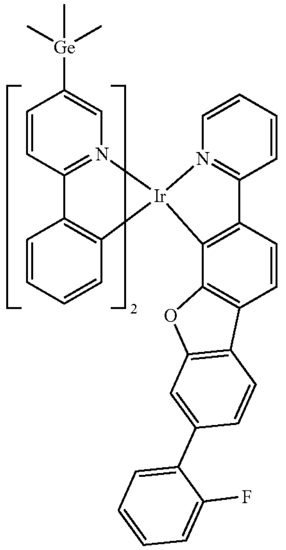
1922
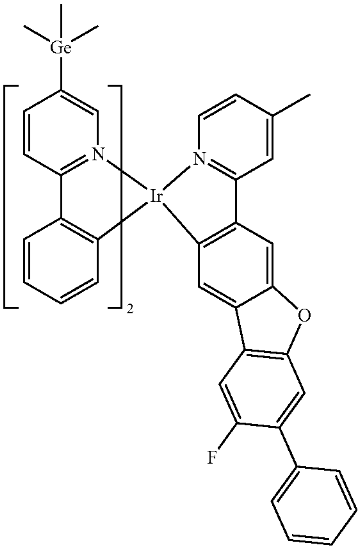
1923
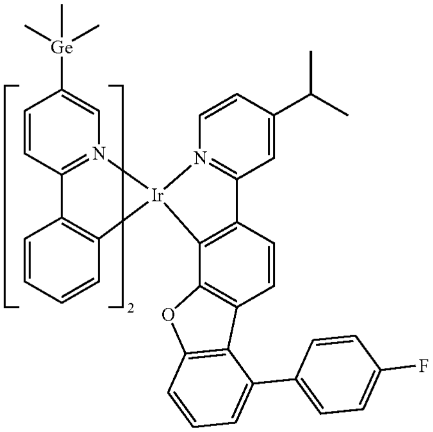
-continued
1924
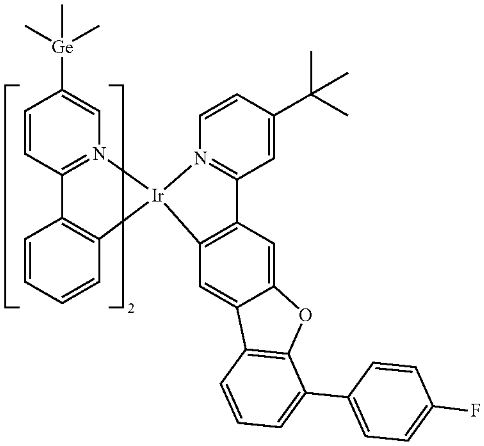
1925
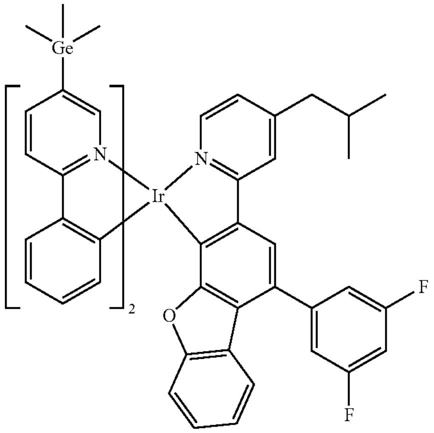
1926
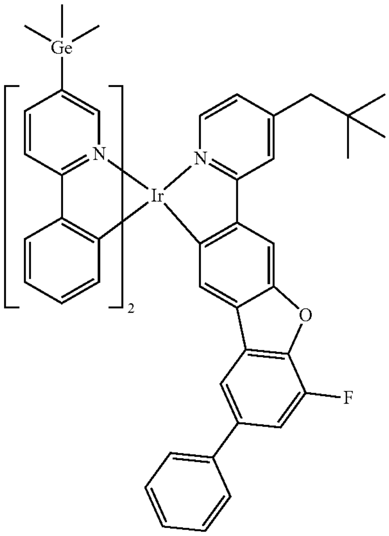

-continued
1927
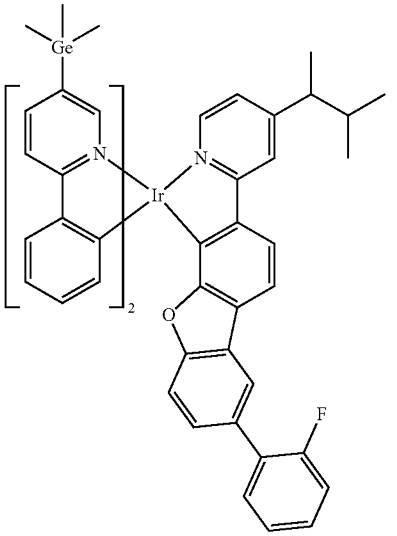
1928
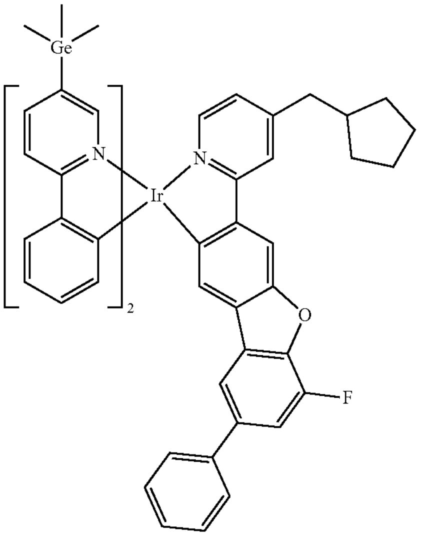
1929
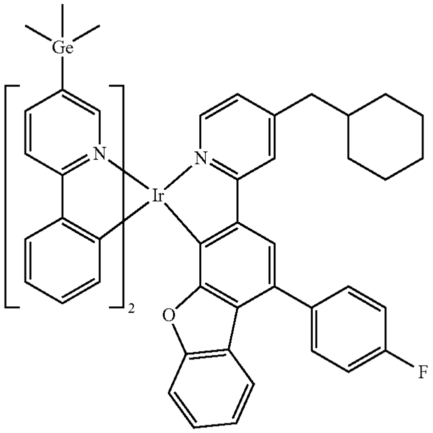
-continued
1930
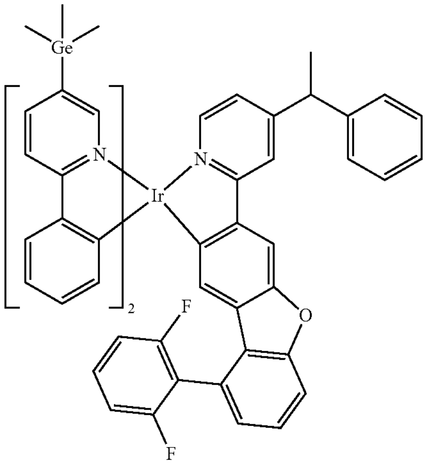
1931
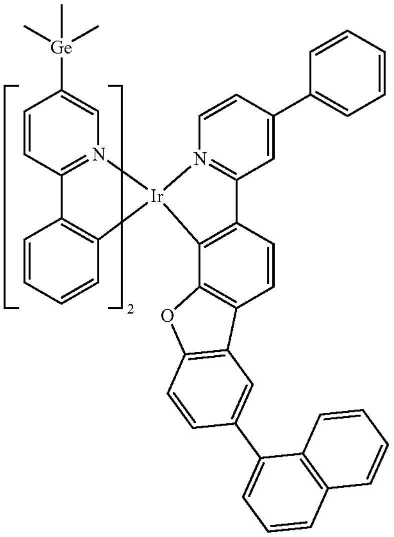
1932
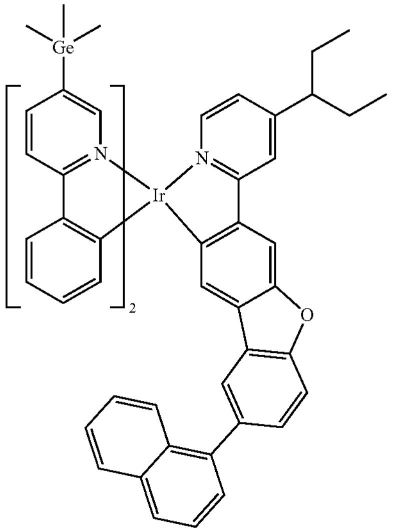

-continued
1933
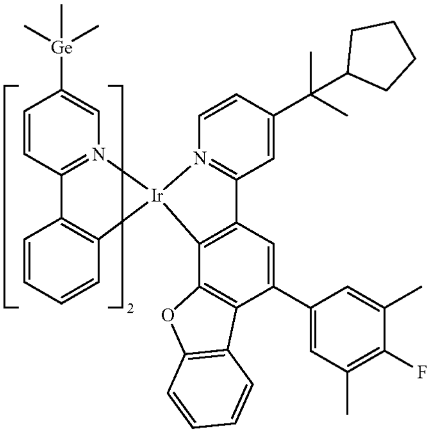
1934
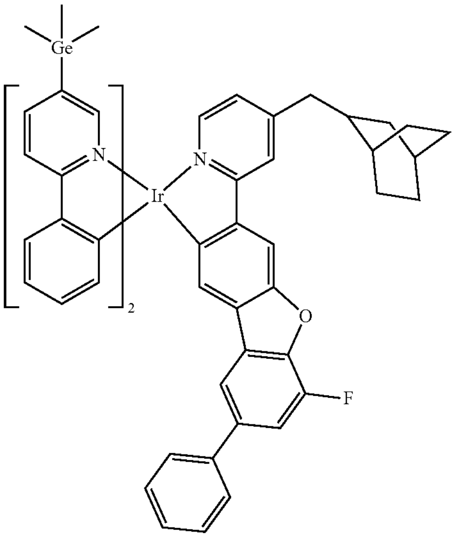
1935
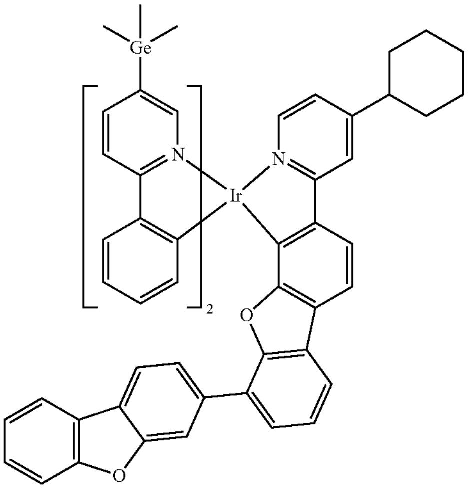
-continued
1936
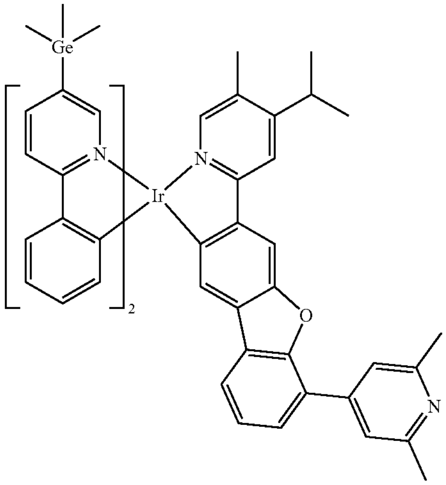
1937
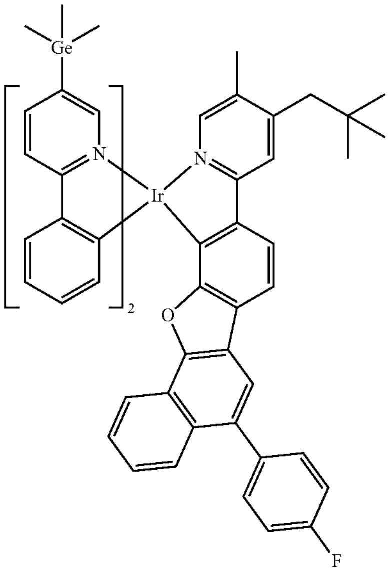
1938
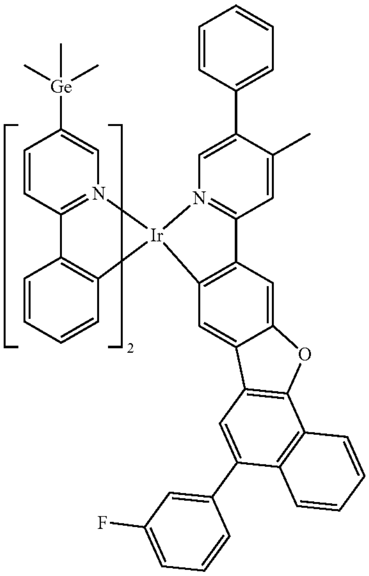

-continued
1939
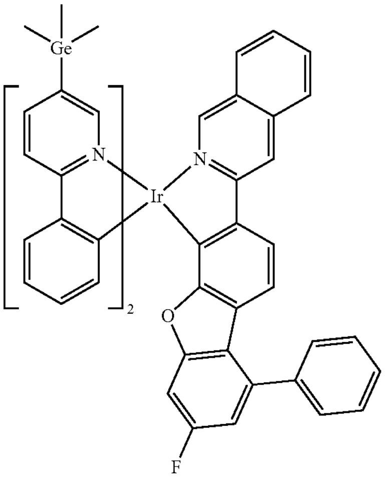
1940
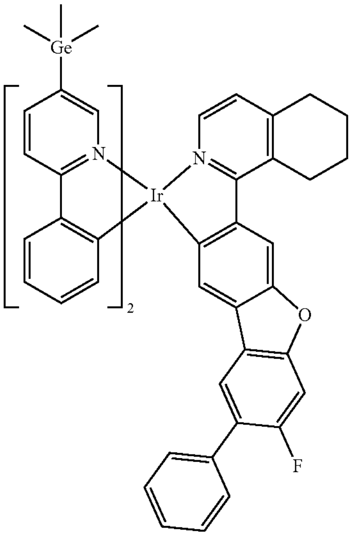
1941
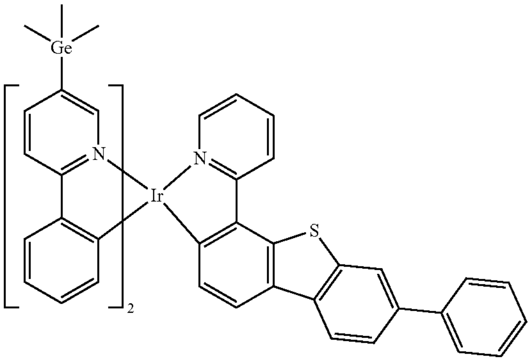
-continued
1942
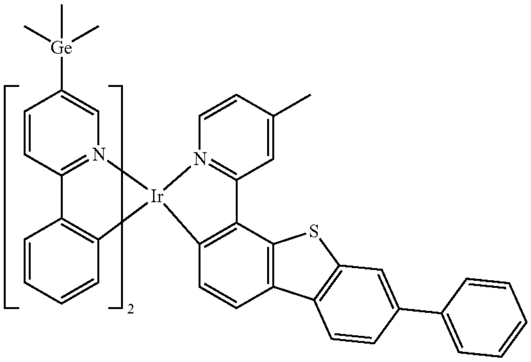
1943
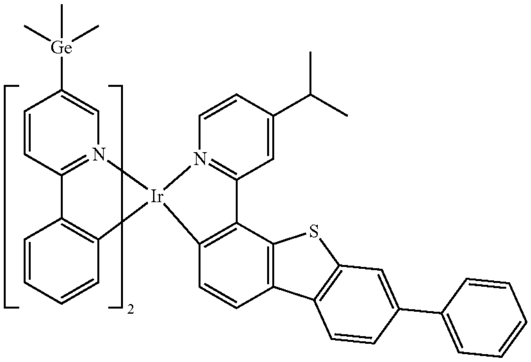
1944
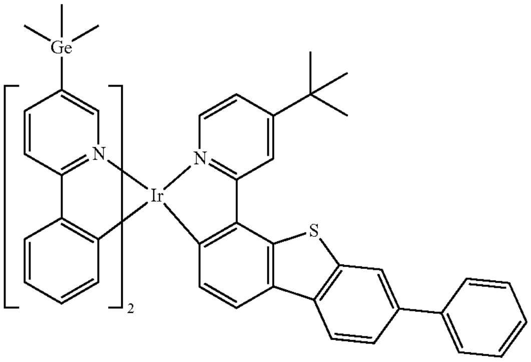
1945
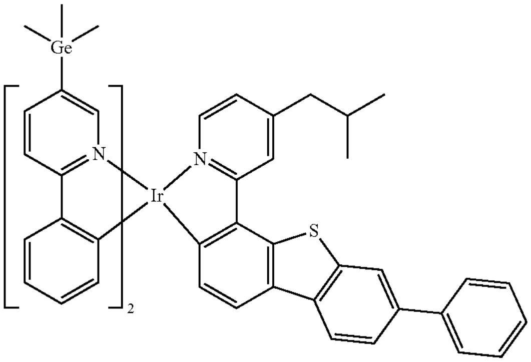

-continued
1946
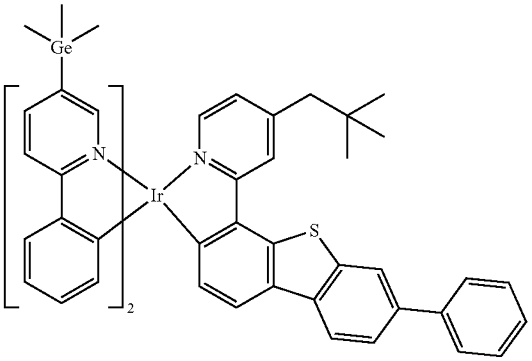
1947
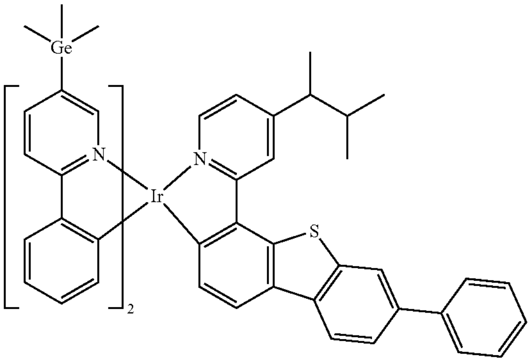
1948
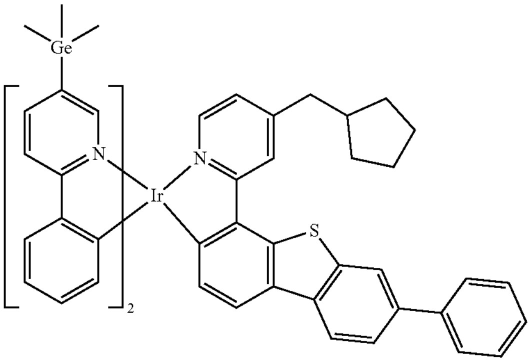
1949
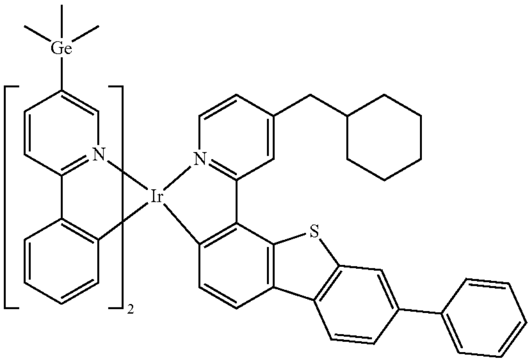
-continued
1950
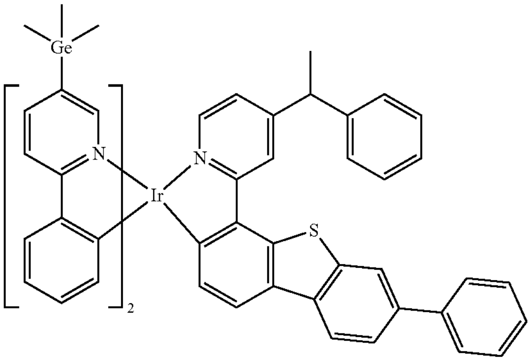
1951
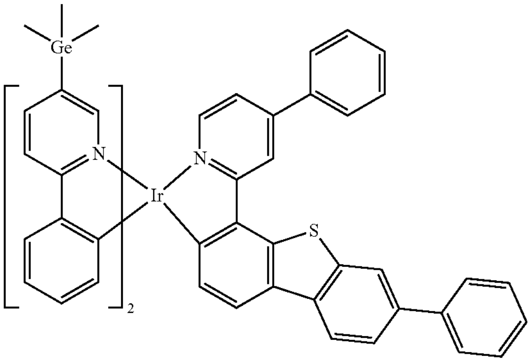
1952
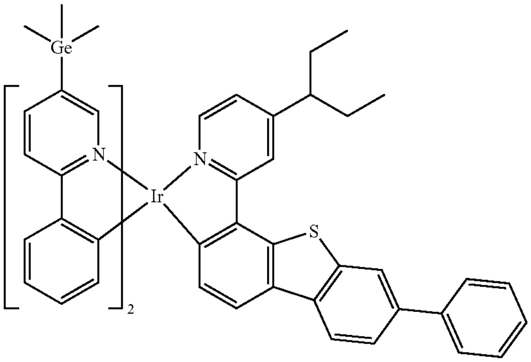
1953
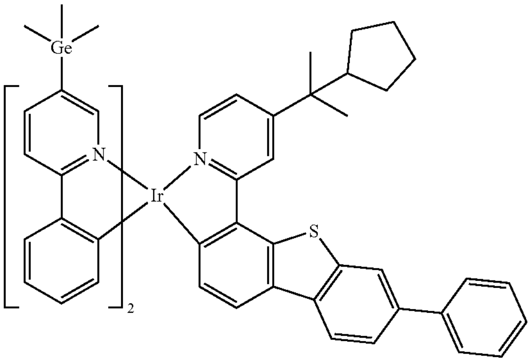

-continued
1954
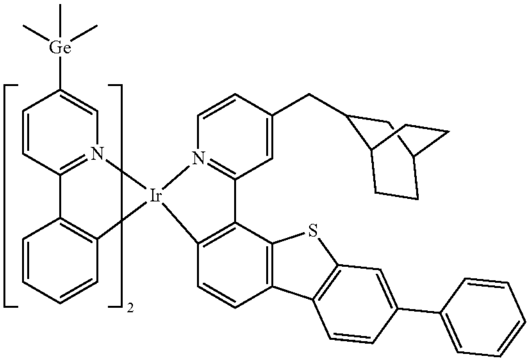
1955
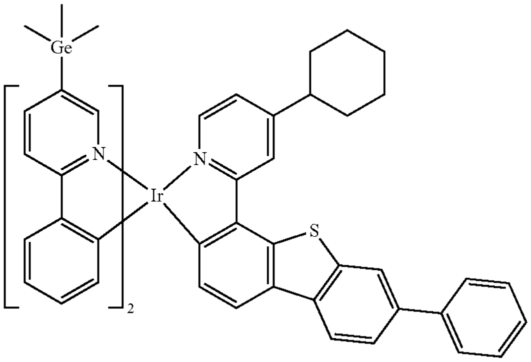
1956
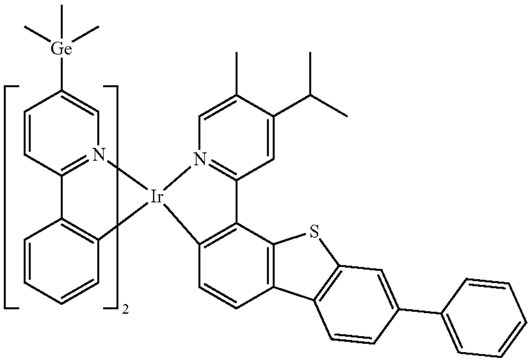
1957
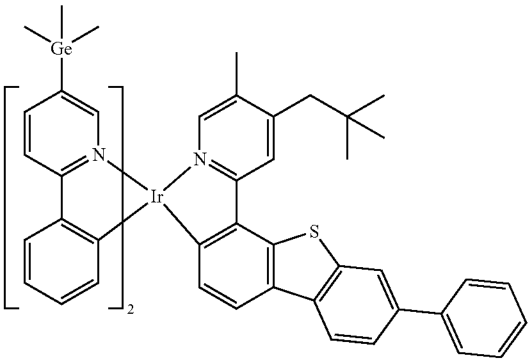
-continued
1958
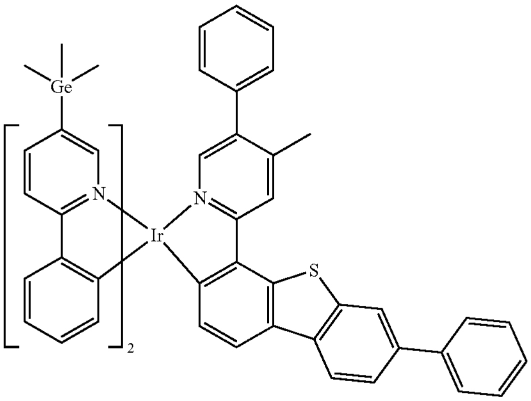
1959
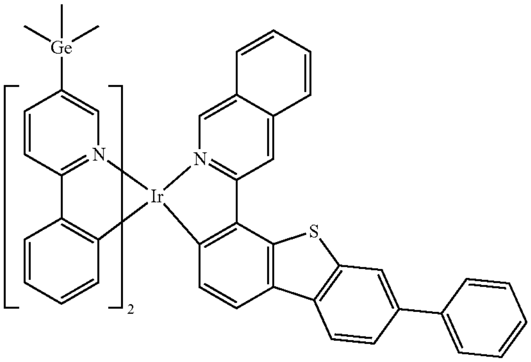
1960
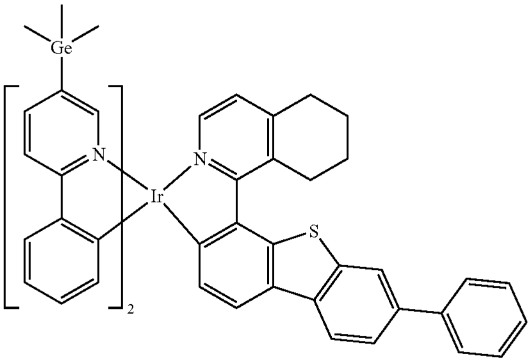
1961
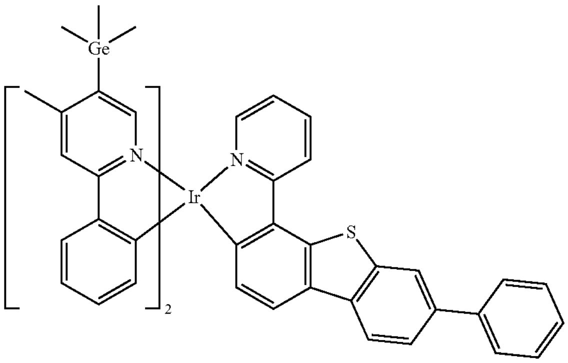

-continued
1962
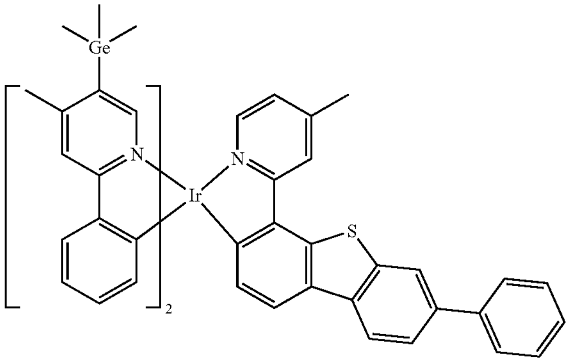
1963
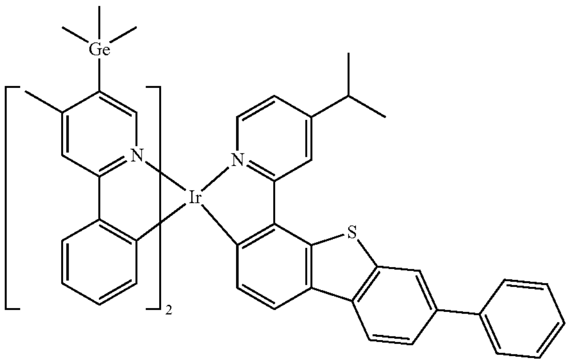
1964
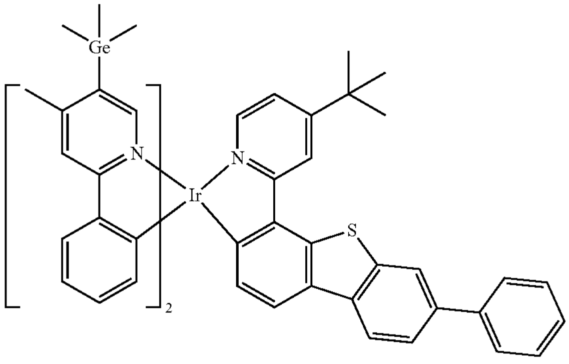
1965
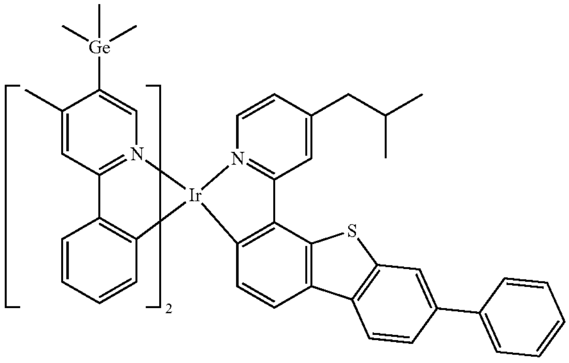
-continued
1966
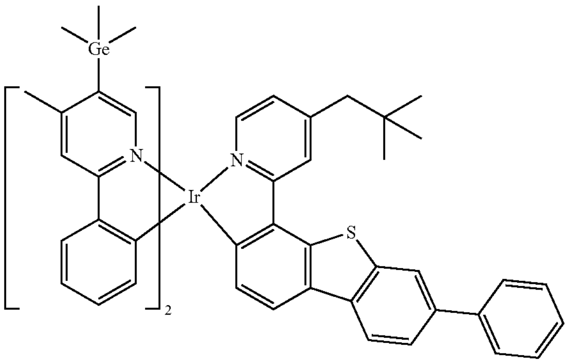
1967
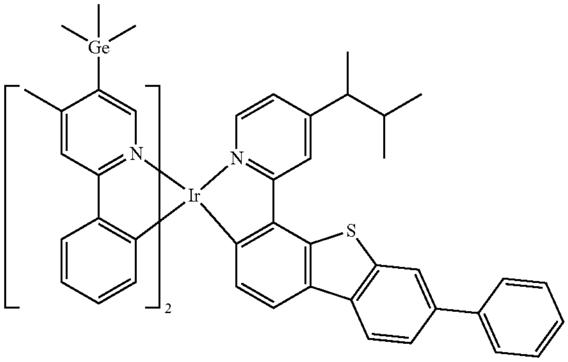
1968
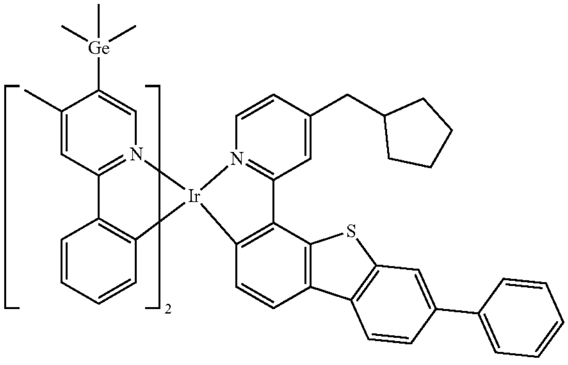
1969
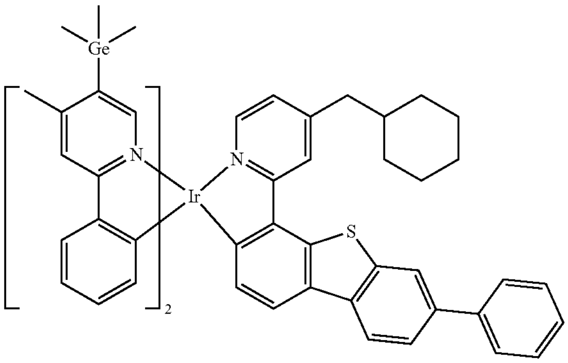

-continued
1970
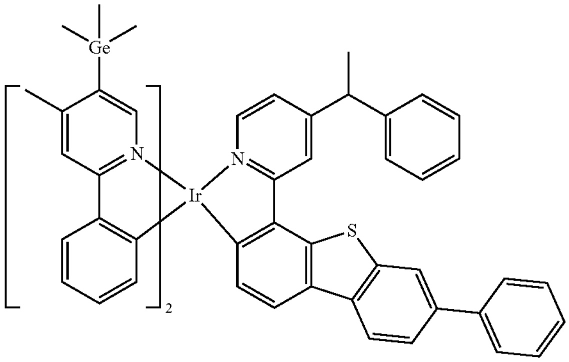
1971
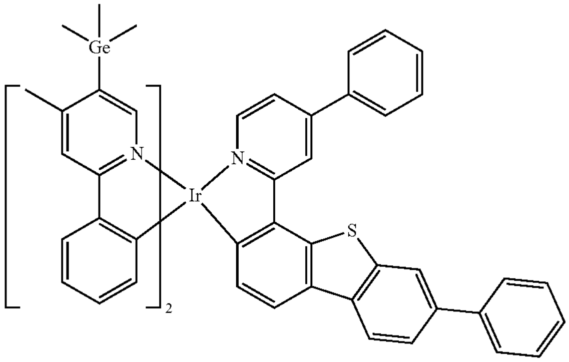
1972
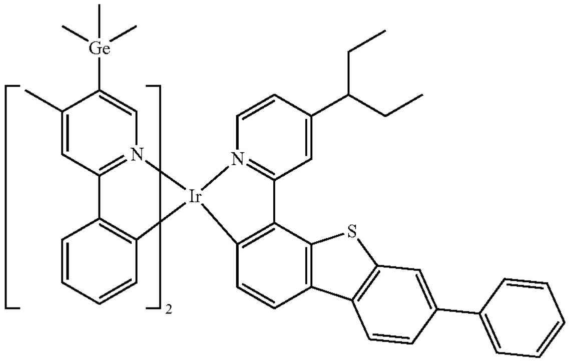
1973
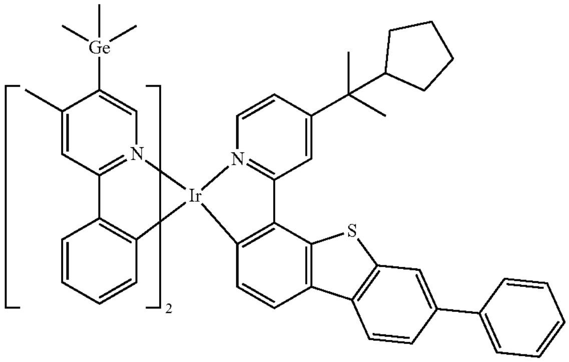
-continued
1974
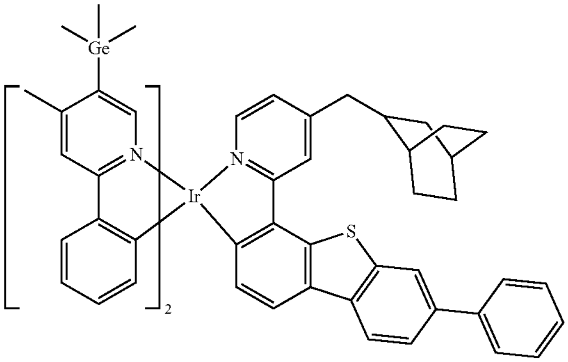
1975
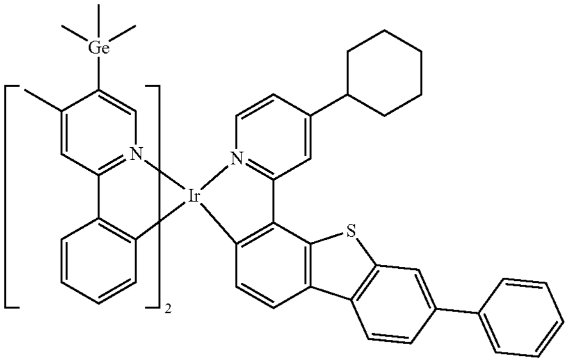
1976
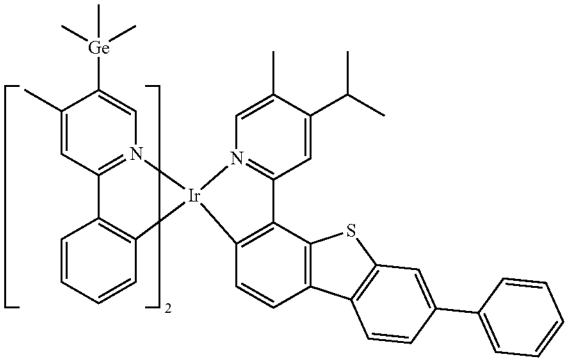
1977
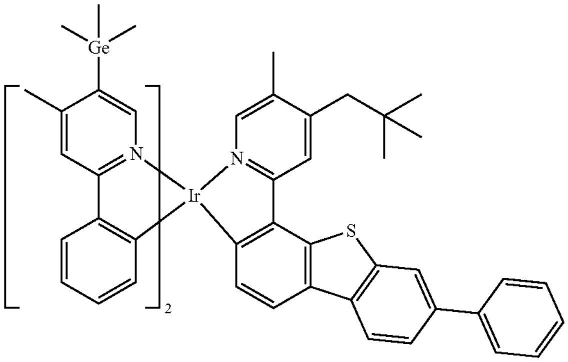

-continued
1978
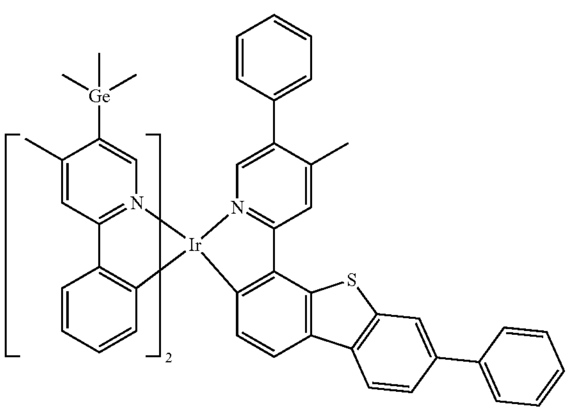
1979
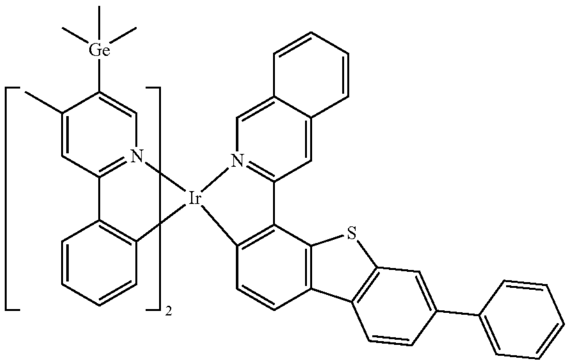
1980
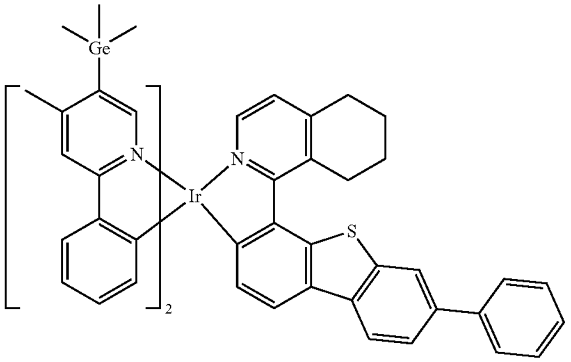
1981
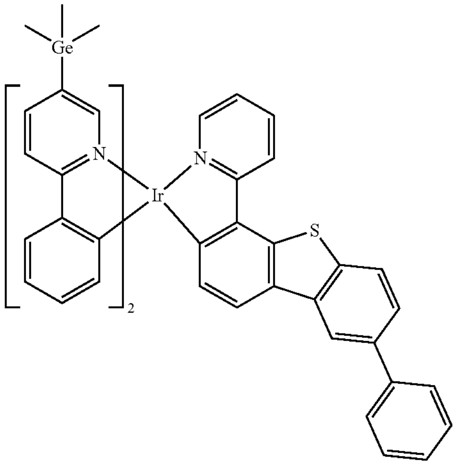
-continued
1982
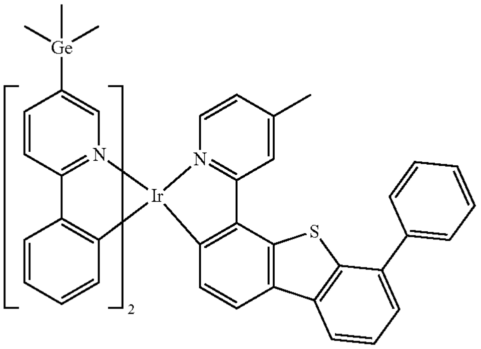
1983
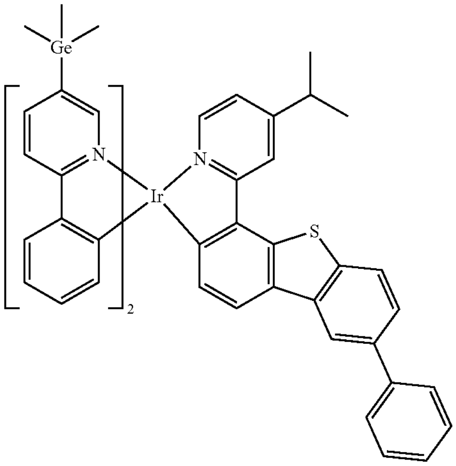
1984
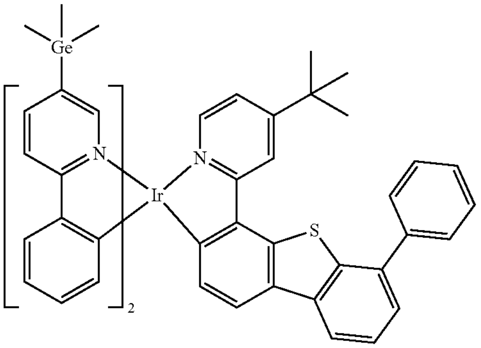
1985
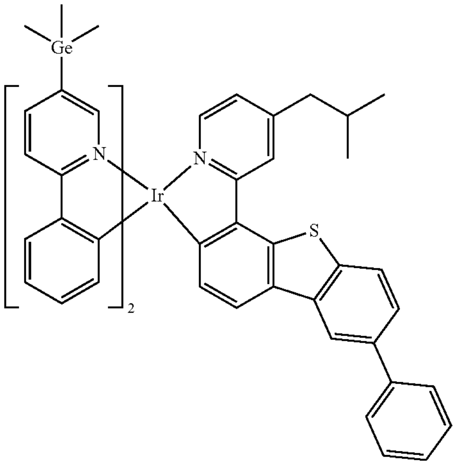

1986
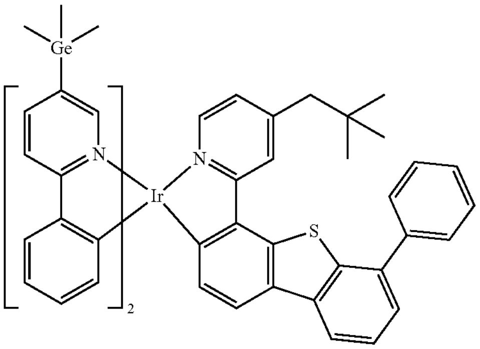
1987
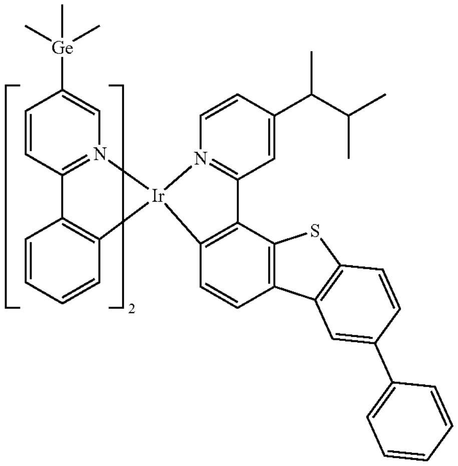
1988
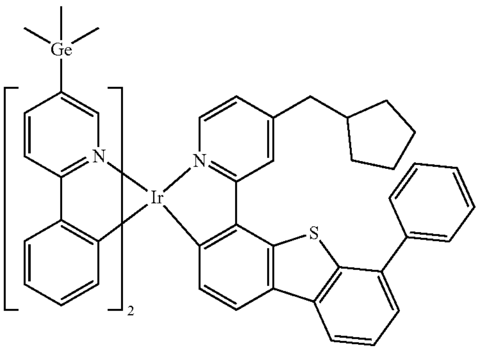
1989
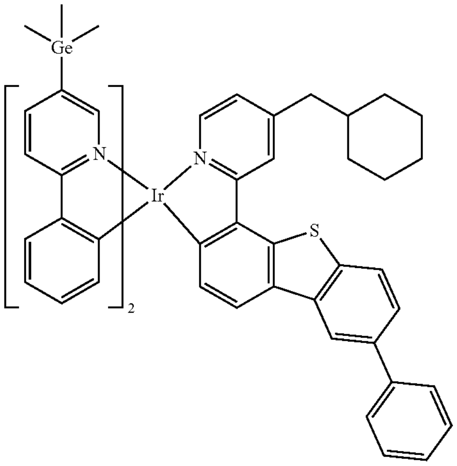
1990
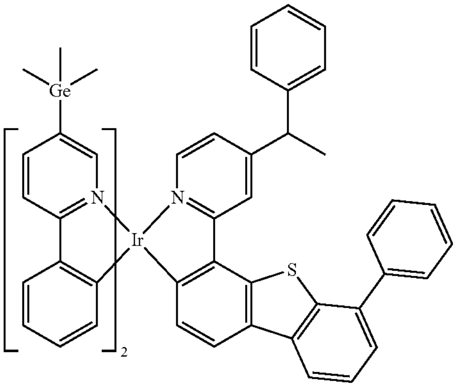
1991
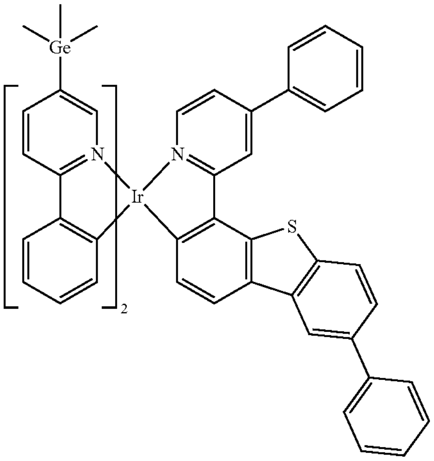

-continued
1992
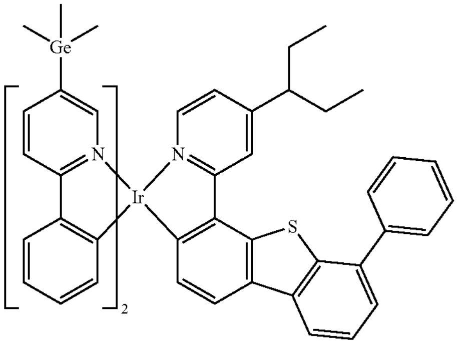
1993
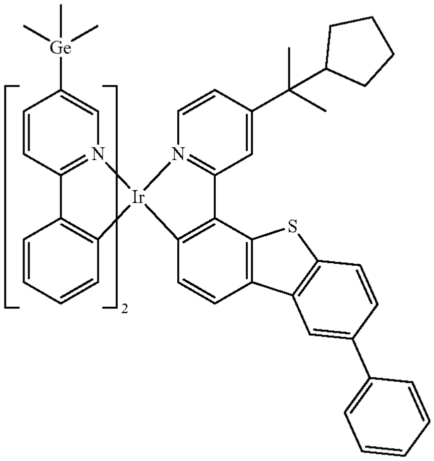
1994
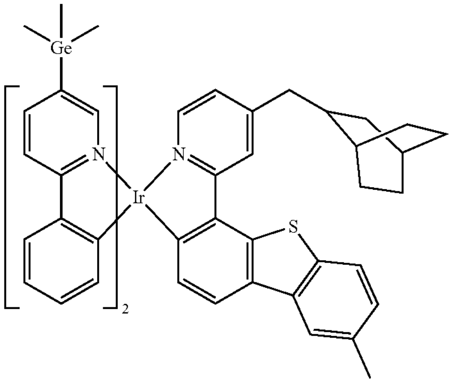
1995
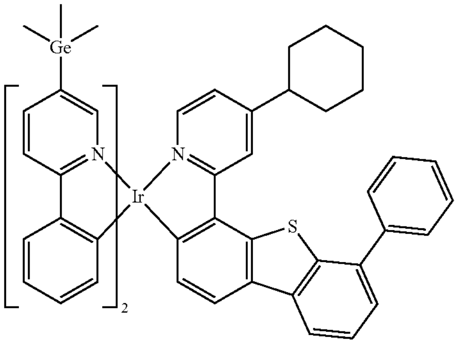
-continued
1996
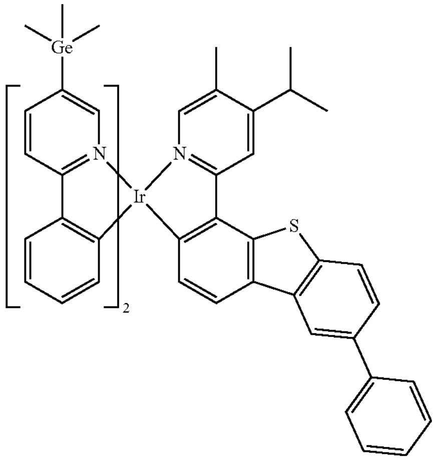
1997
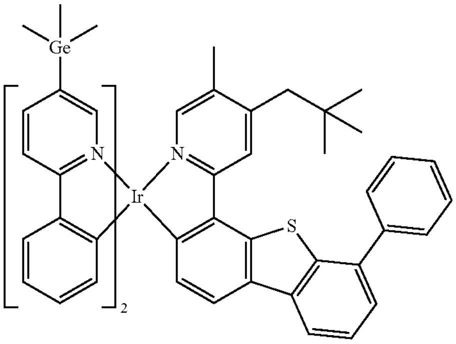
1998
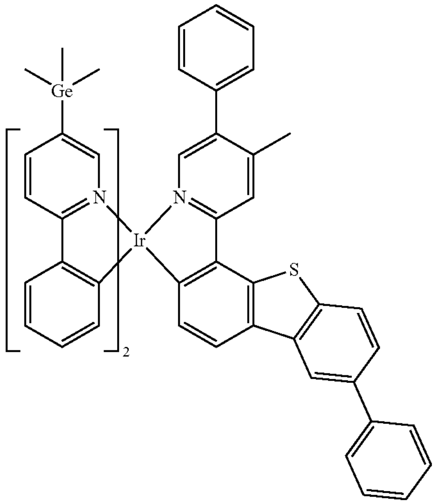

-continued
1999
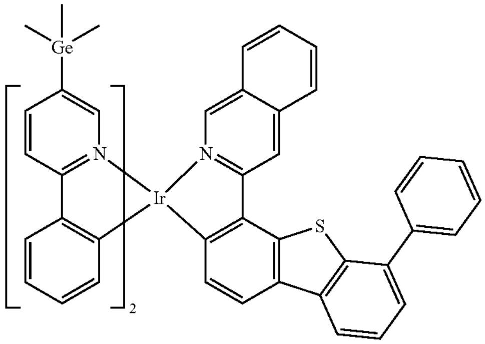
2000
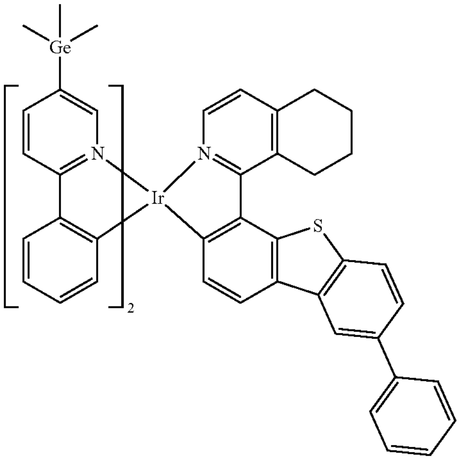
2001
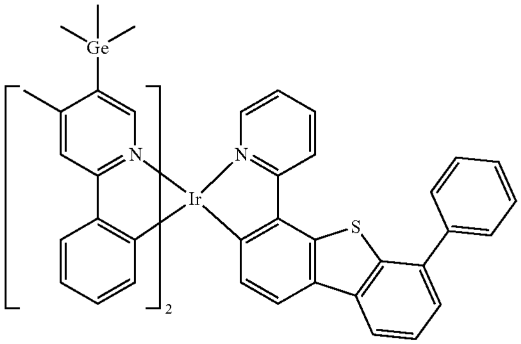
2002
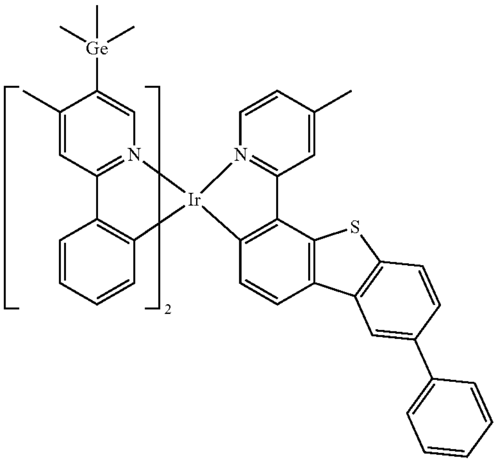
2003
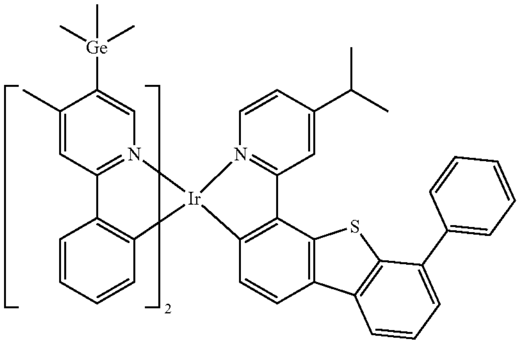
2004
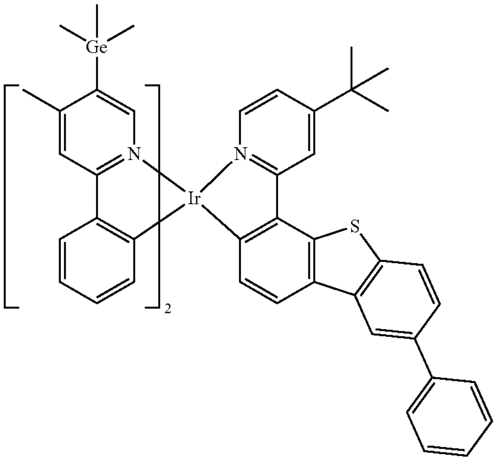
2005
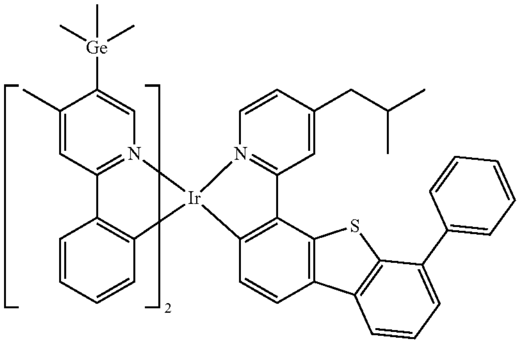
2006
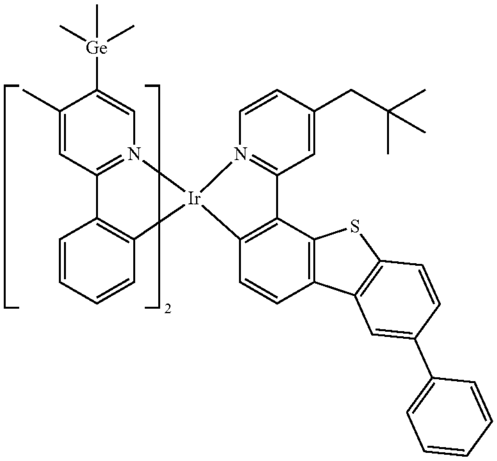

-continued
2007
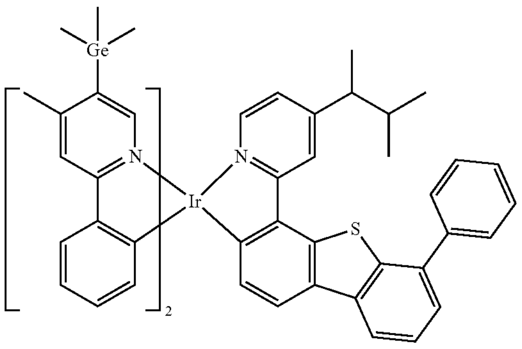
2008
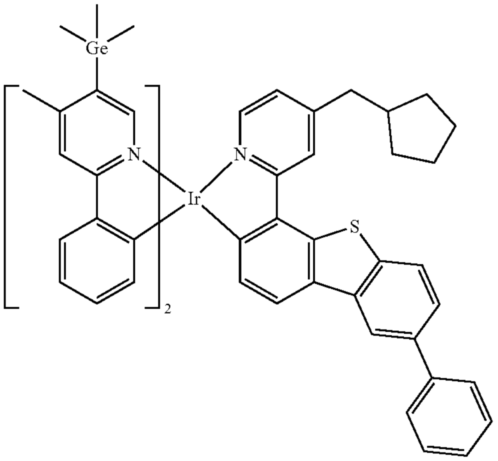
2009
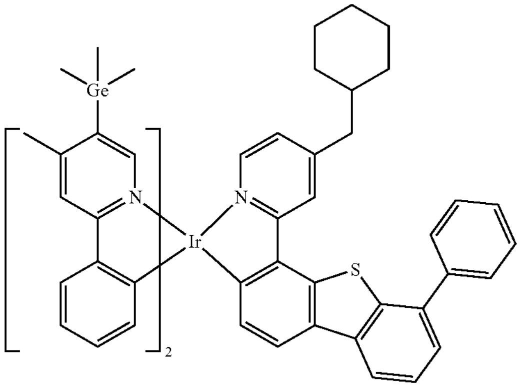
-continued
2010
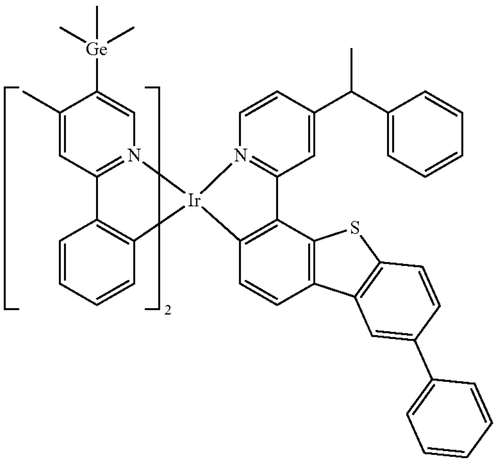
2011
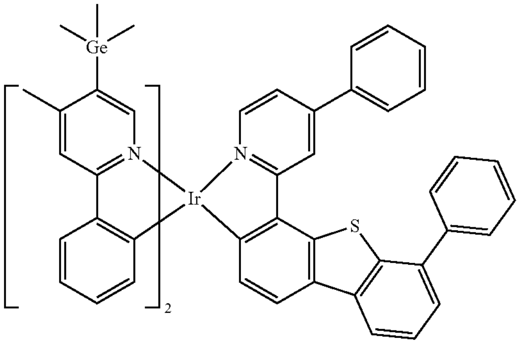
2012
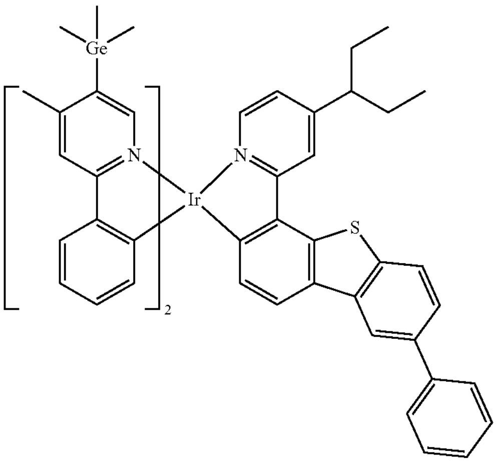
2013
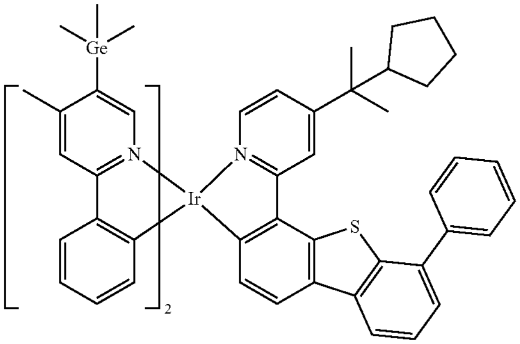

-continued
2014
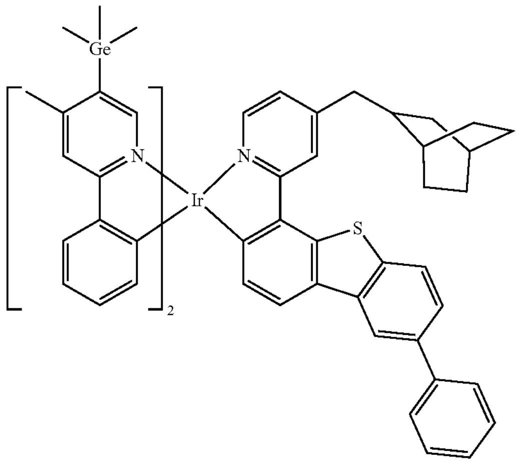
2015
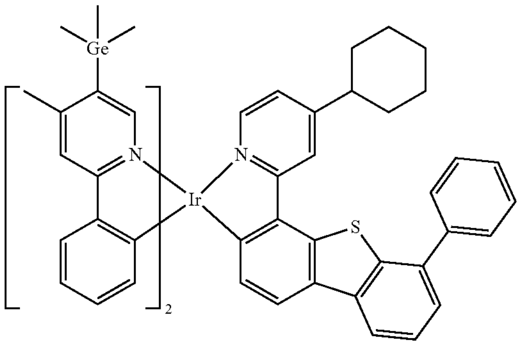
2016
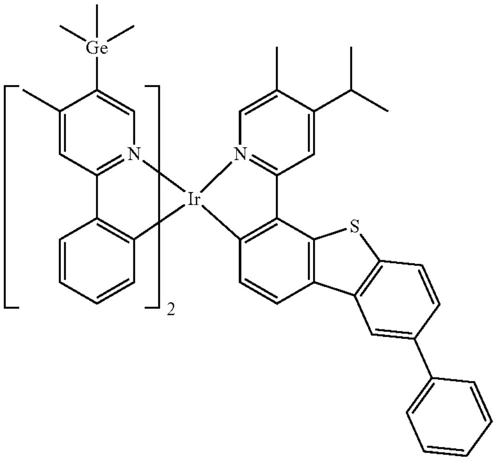
-continued
2017
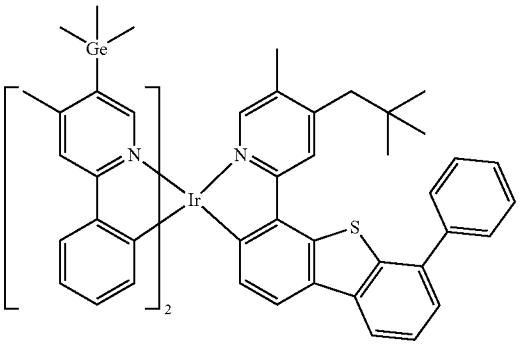
2018
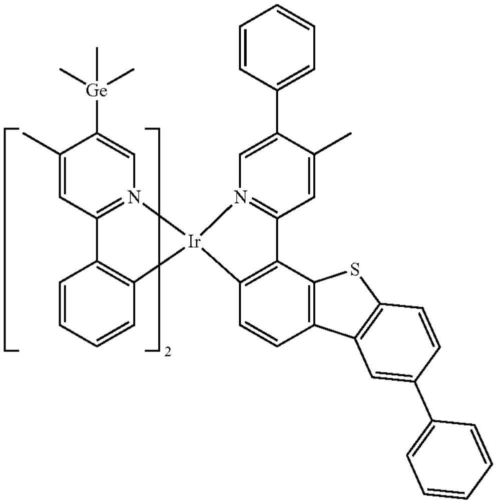
2019
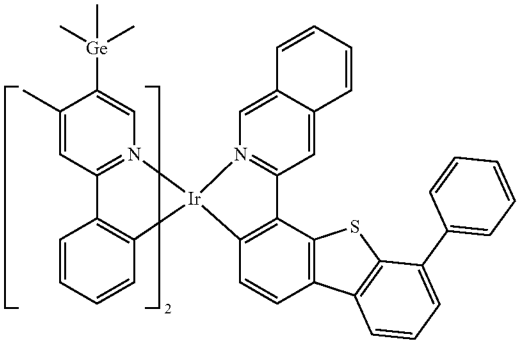

-continued
2020
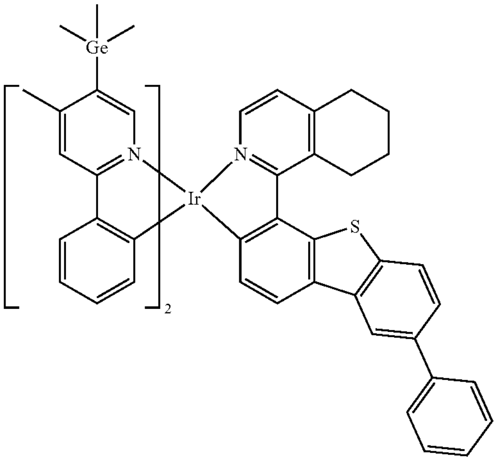
2021
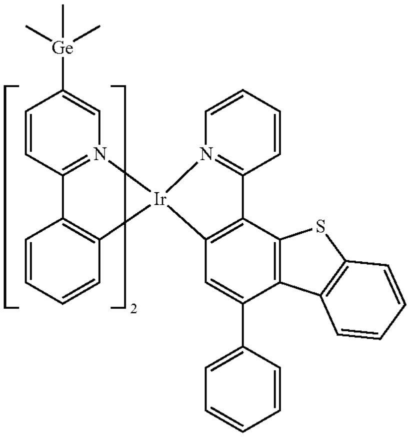
2022
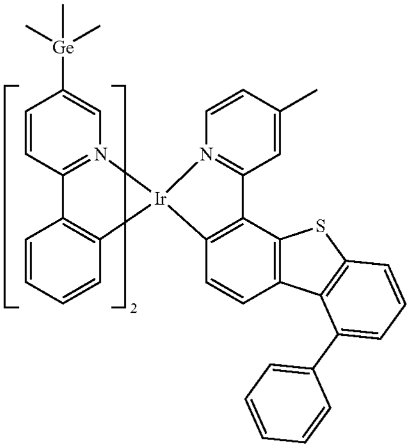
-continued
2023
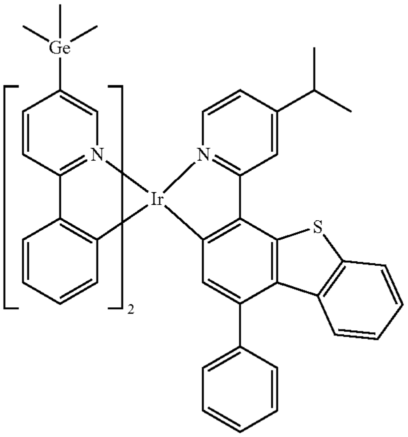
2024
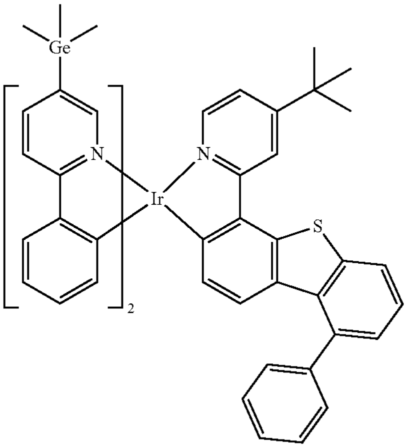
2025
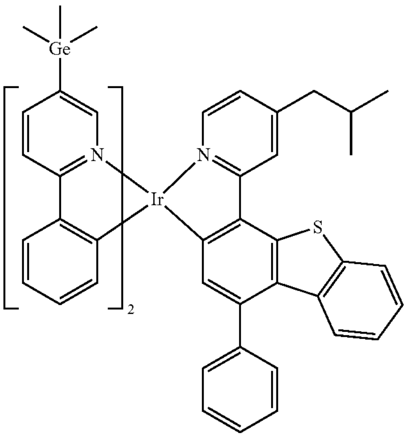

-continued
2026
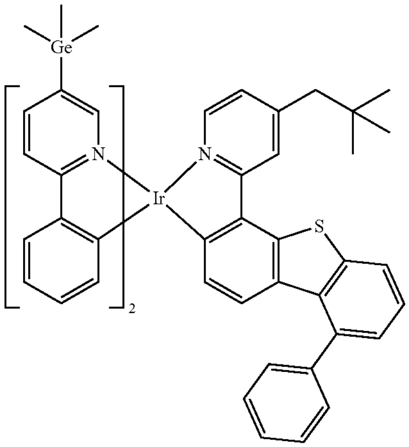
2027
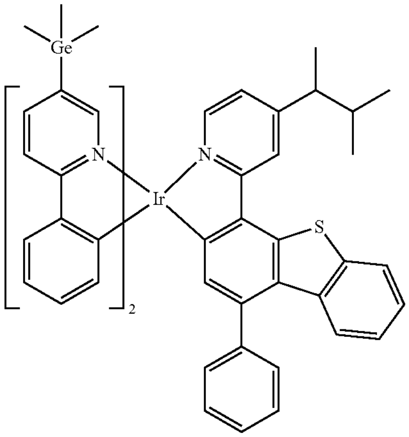
2028
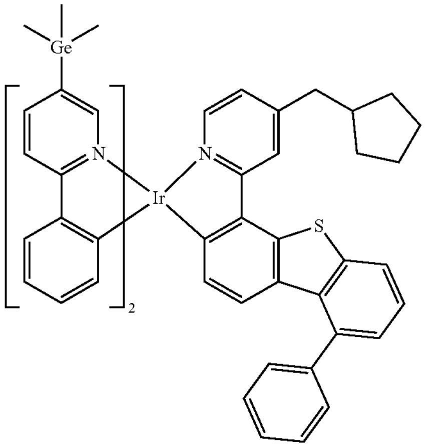
-continued
2029
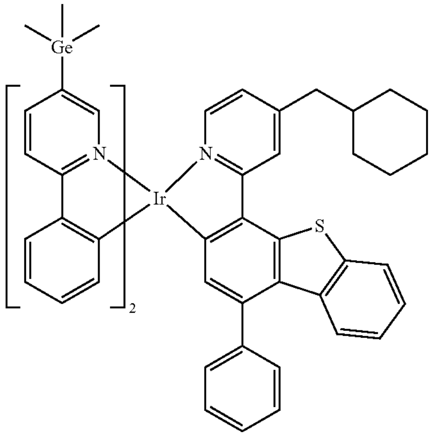
2030
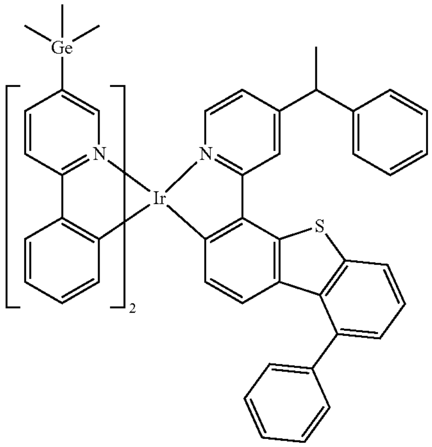
2031
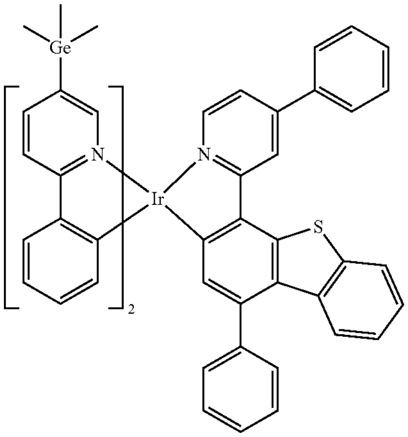

-continued
2032
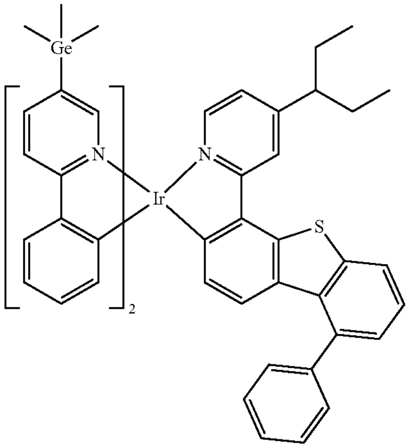
2033
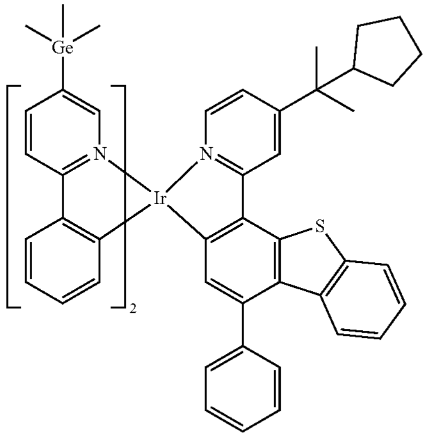
2034
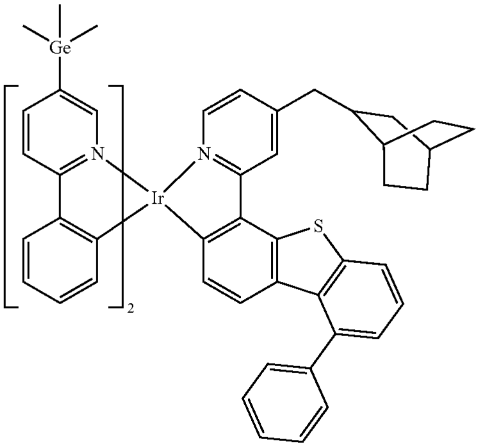
-continued
2035
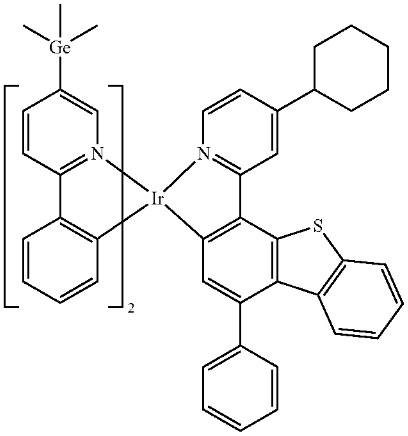
2036
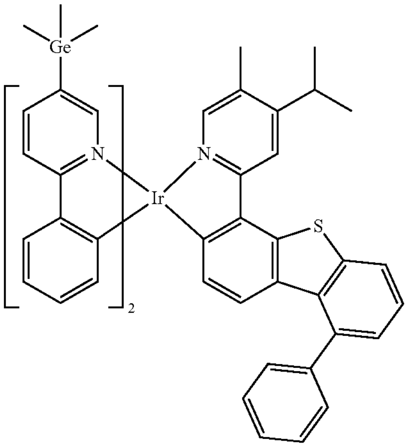
2037
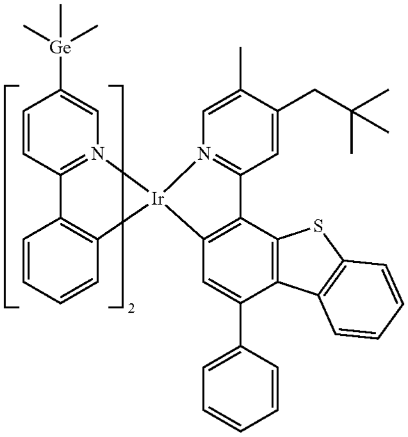

-continued
2038
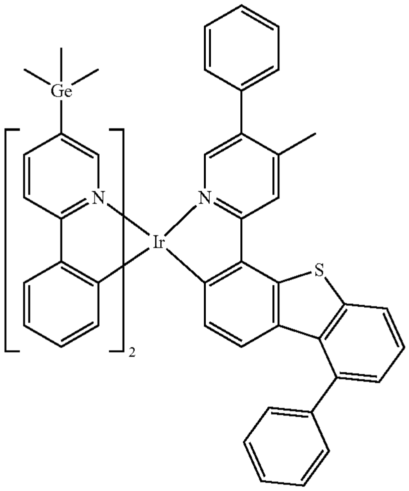
2039
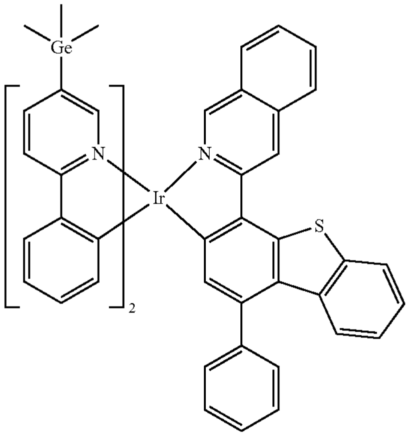
2040
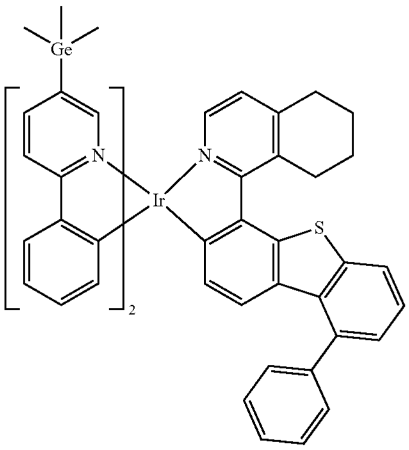
-continued
2041
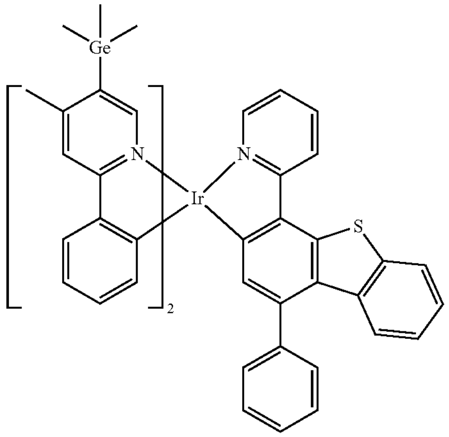
2042
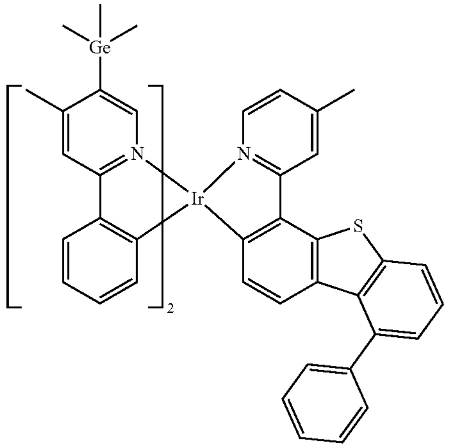
2043
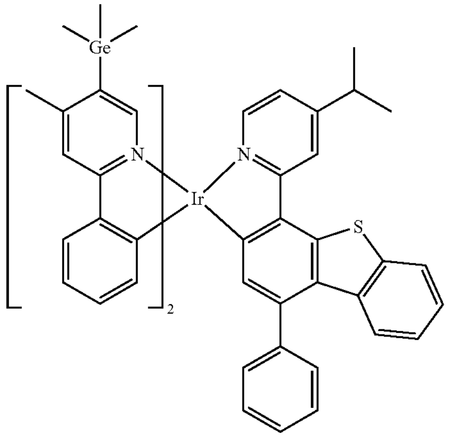

-continued
2044
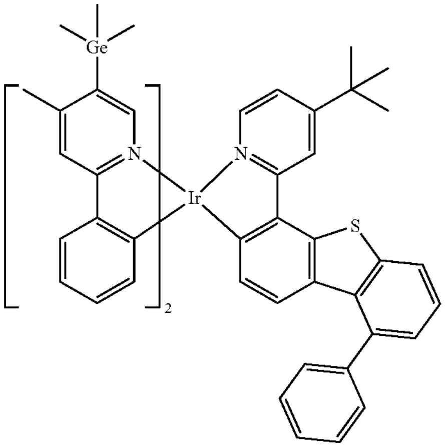
2045
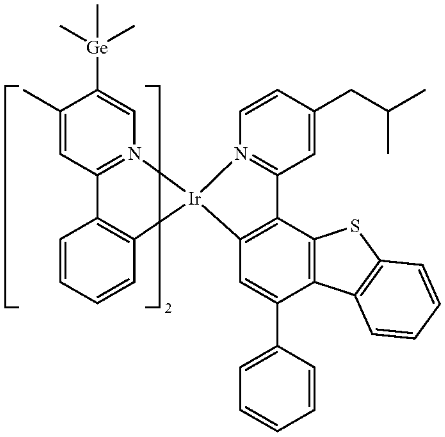
2046
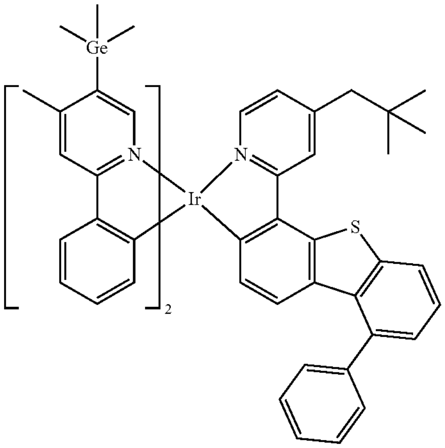
-continued
2047
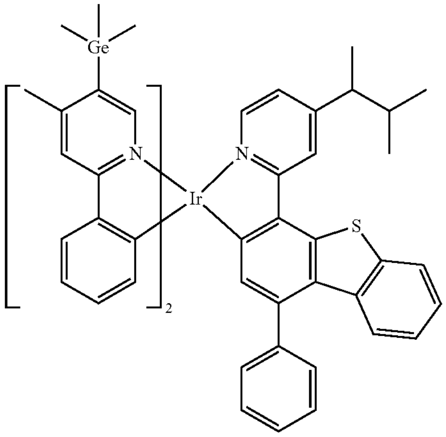
2048
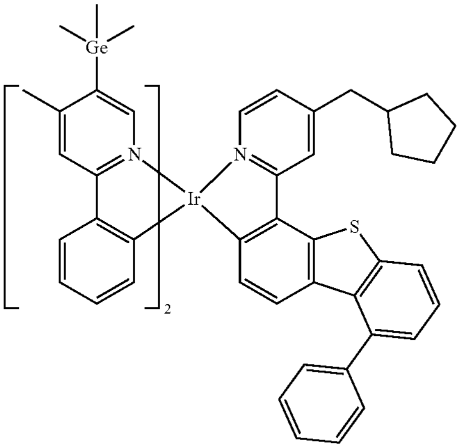
2049
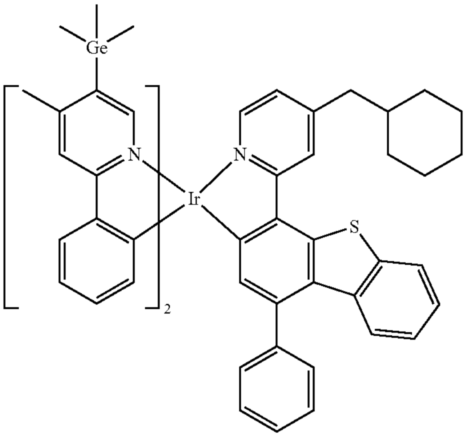

-continued
2050
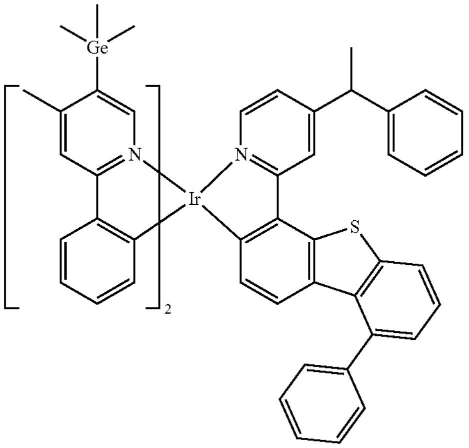
2051
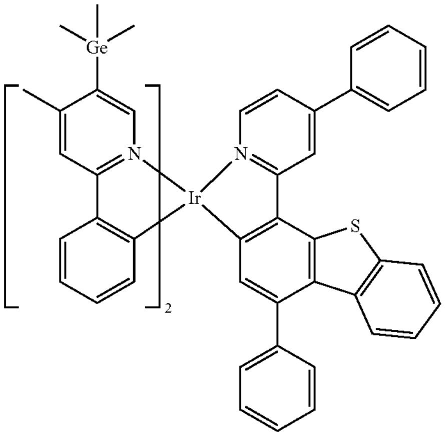
2052
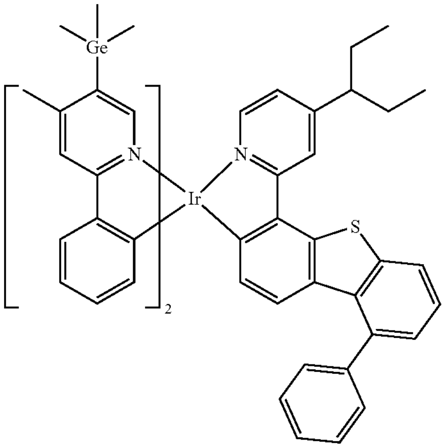
-continued
2053
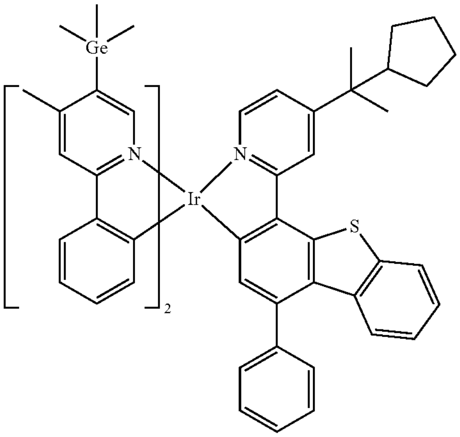
2054
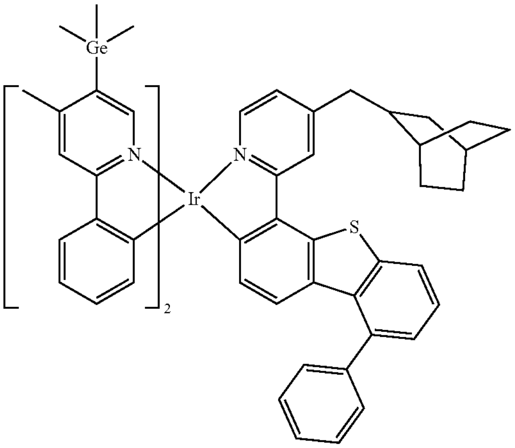
2055
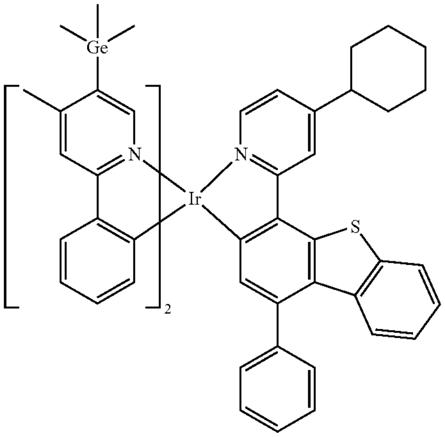

-continued
2056
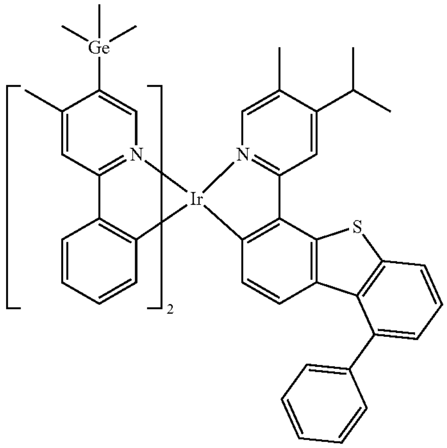
2057
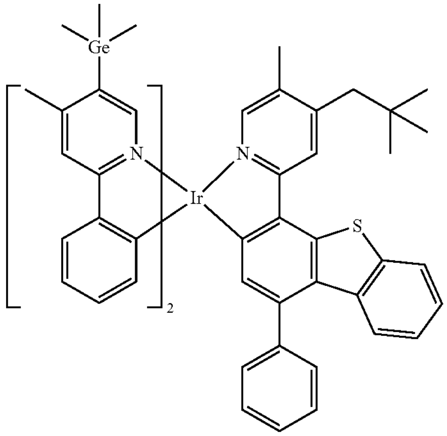
2058
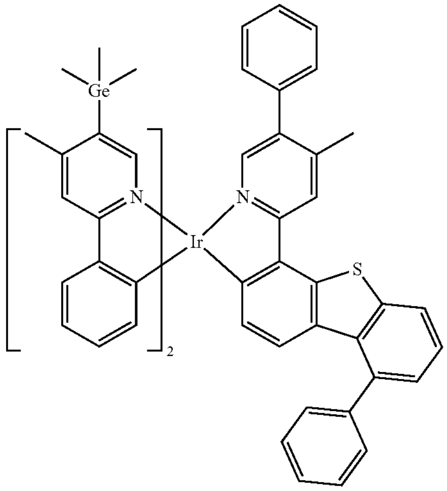
-continued
2059
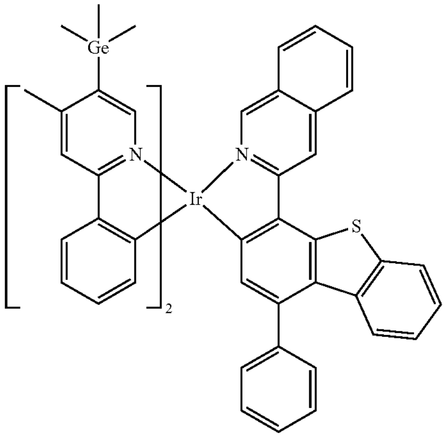
2060
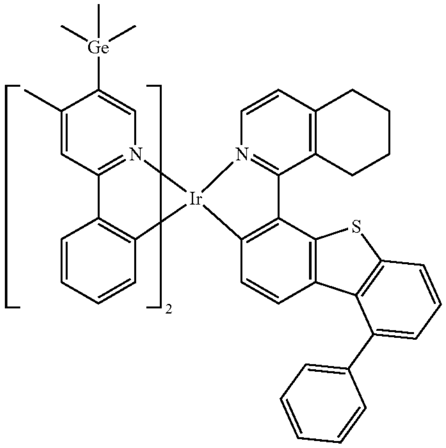
2061
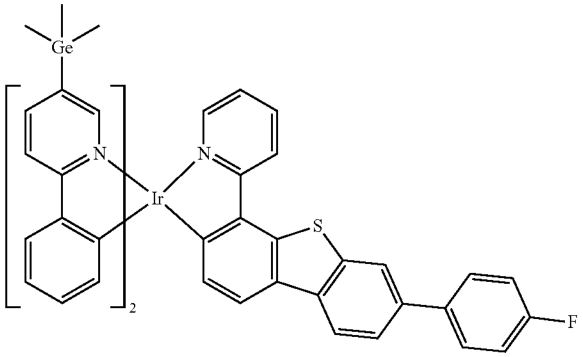
2062
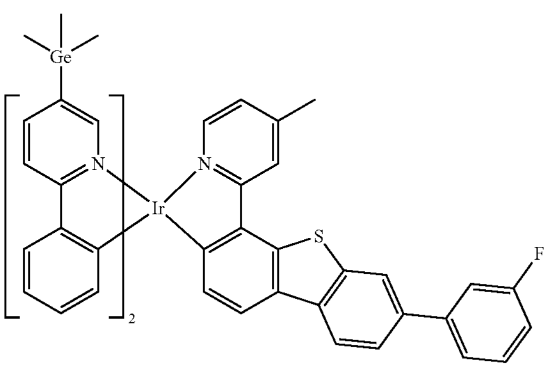

-continued
2063
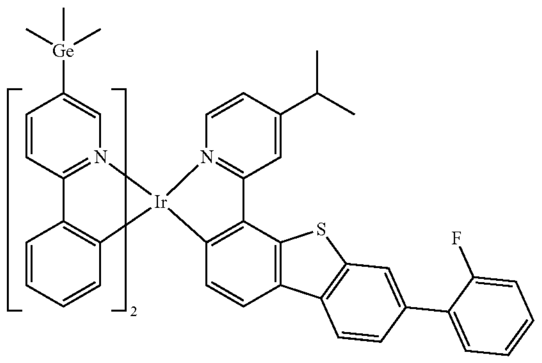
2064
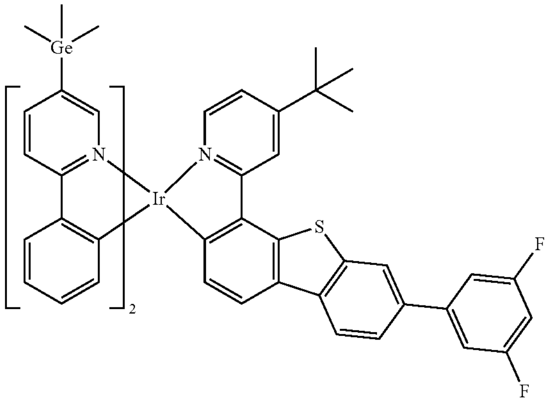
2065
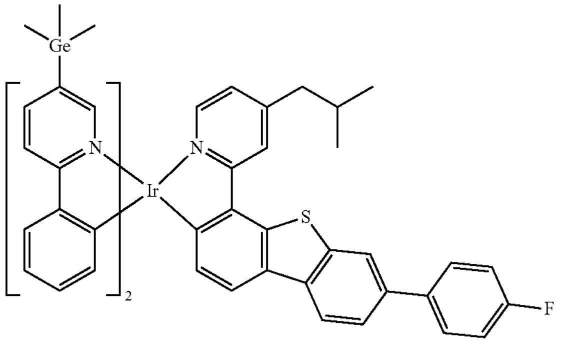
2066
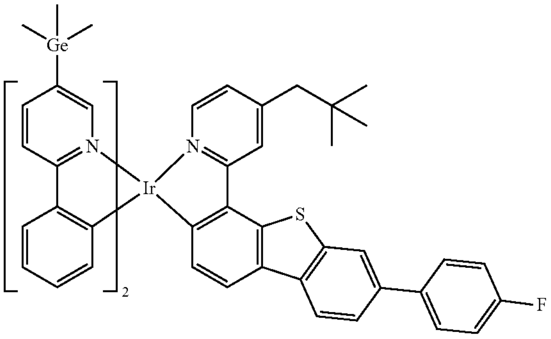
-continued
2067
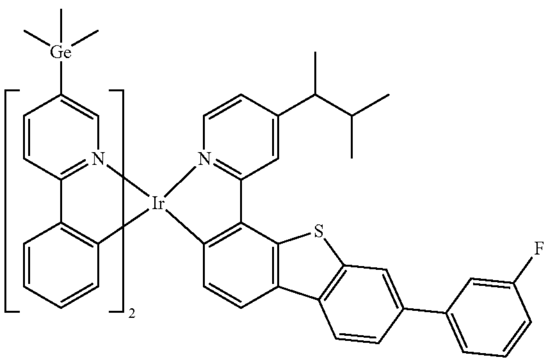
2068
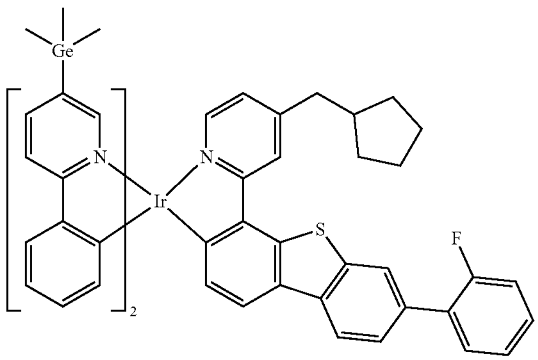
2069
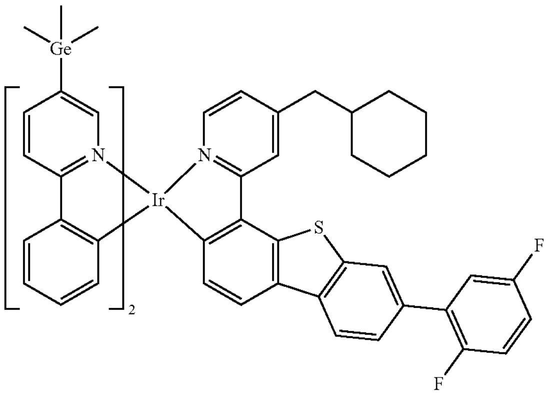
2070
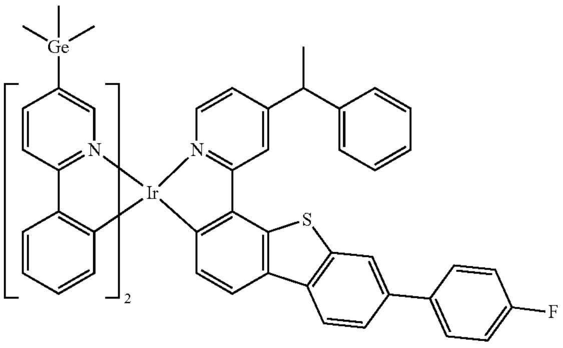

-continued
2071
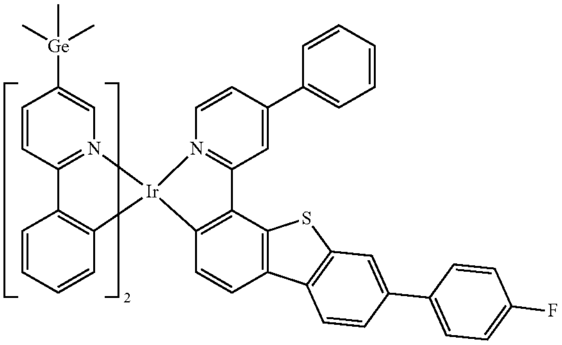
2072
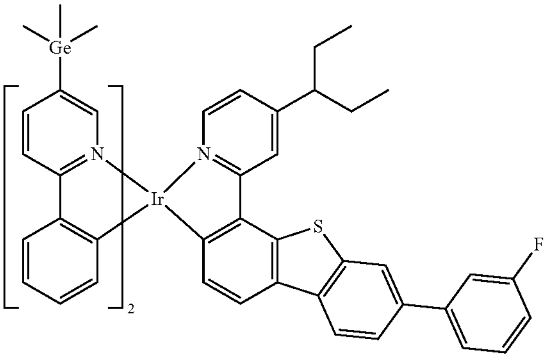
2073
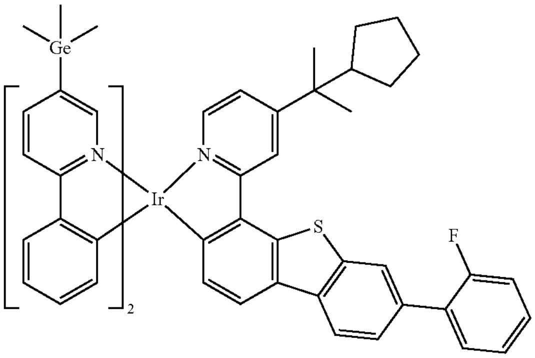
2074
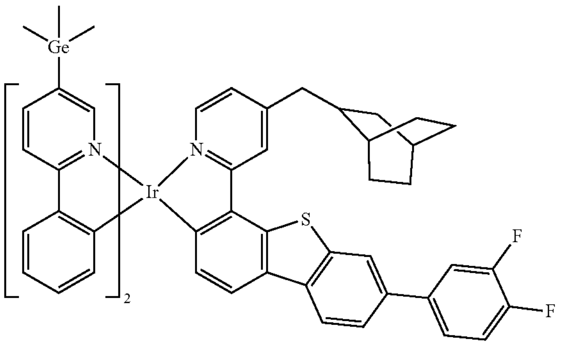
-continued
2075
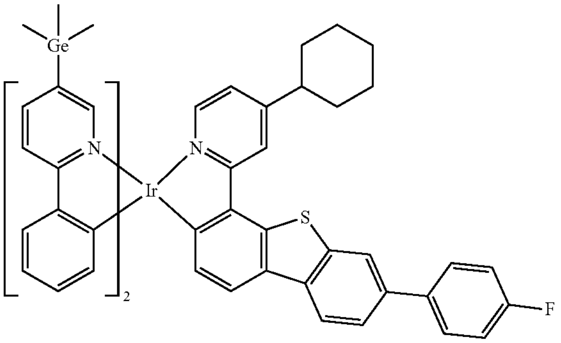
2076
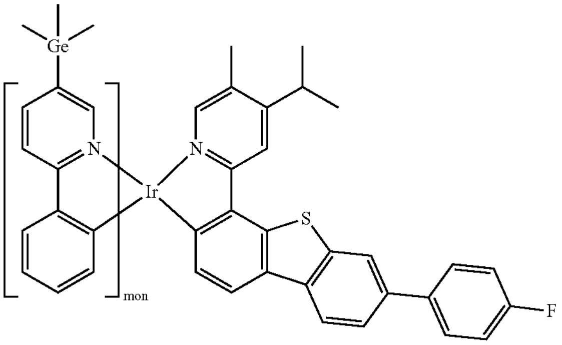
2077
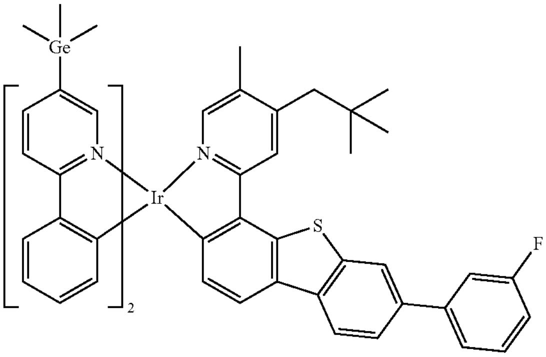
2078
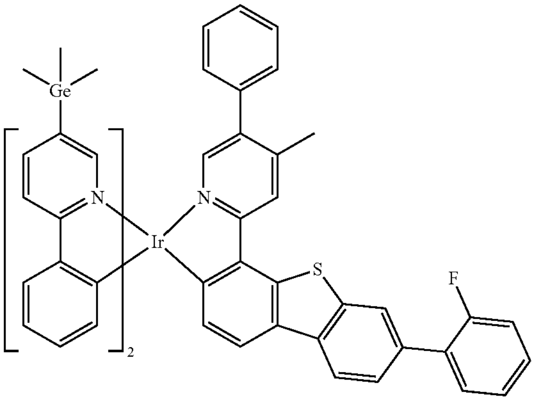

-continued
2079
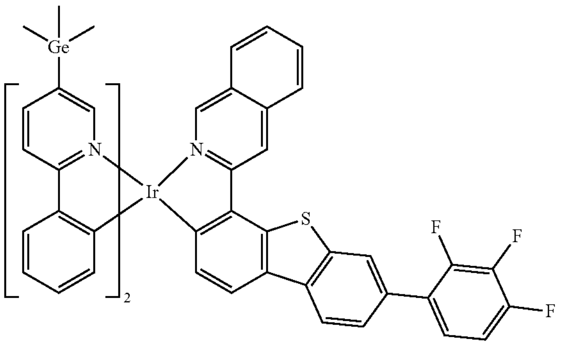
2080
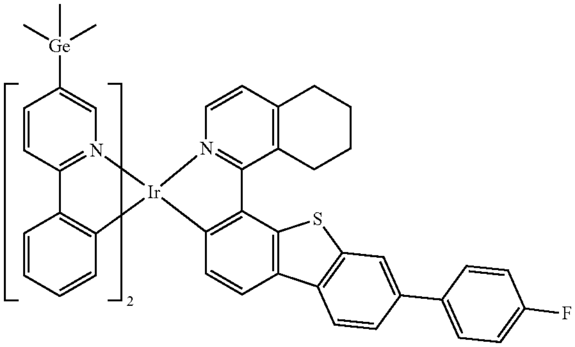
2081
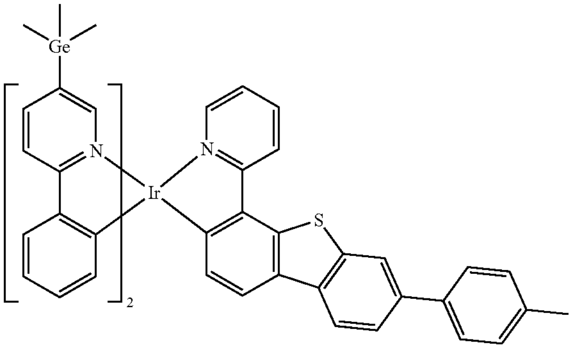
2082
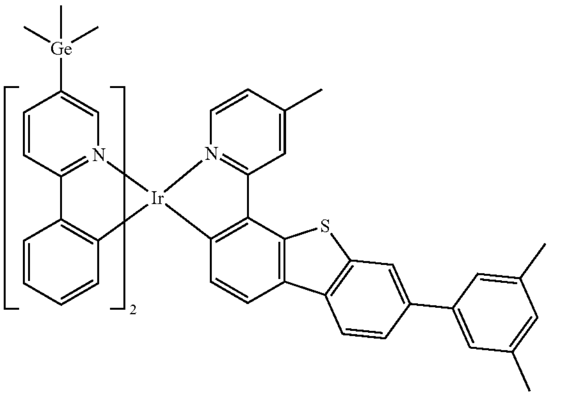
-continued
2083
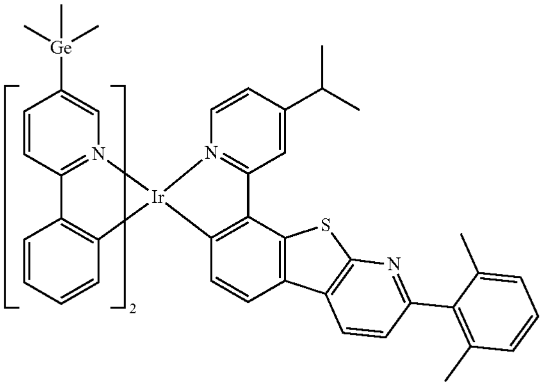
2084
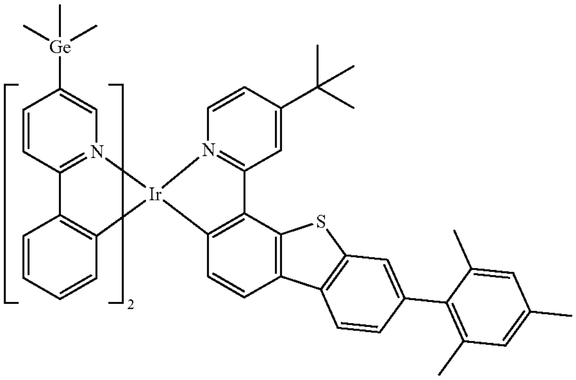
2085
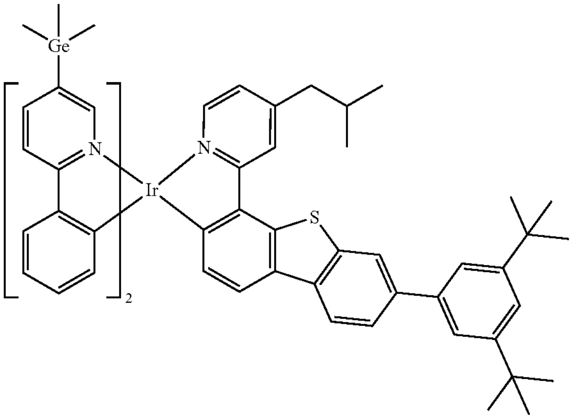
2086
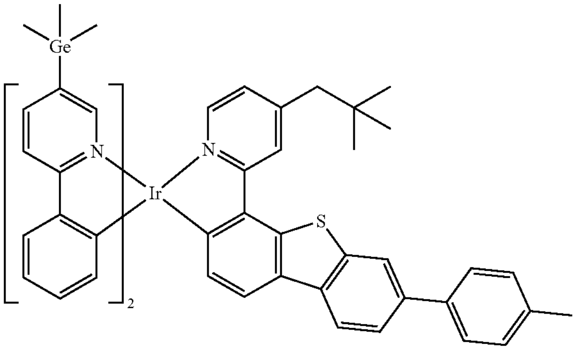

-continued
2087
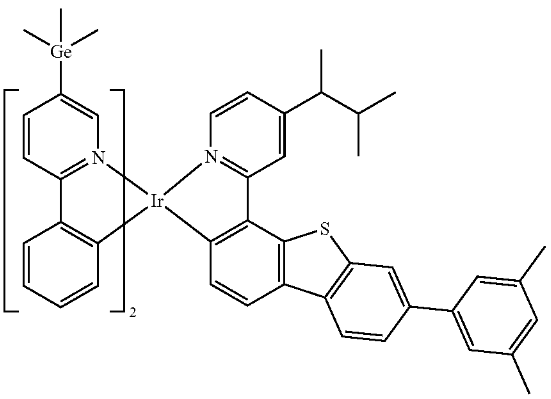
2088
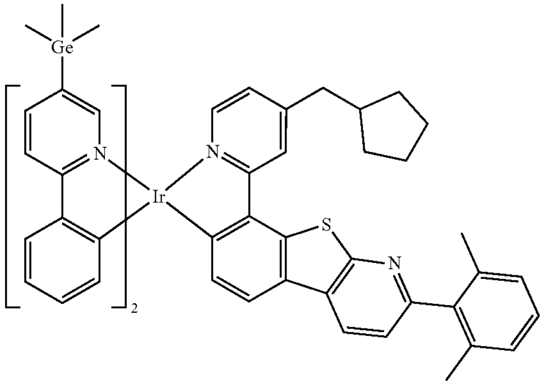
2089
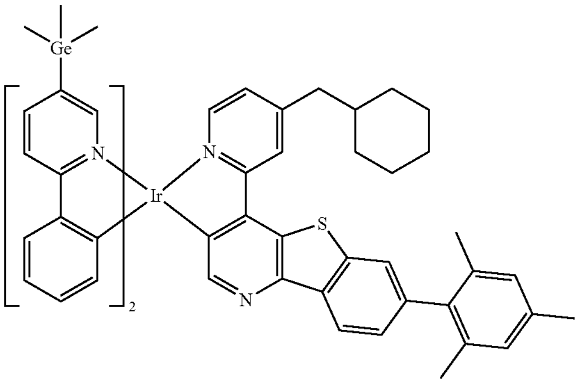
-continued
2090
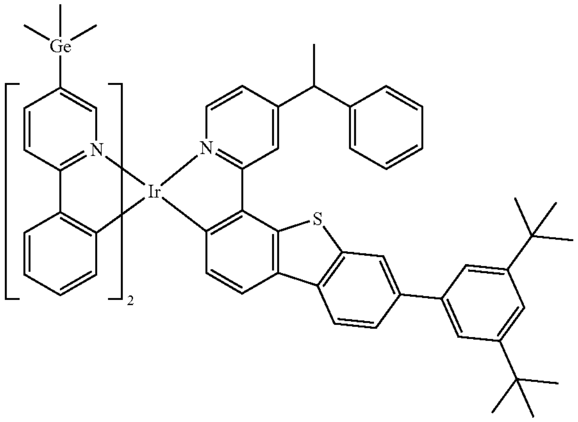
2091
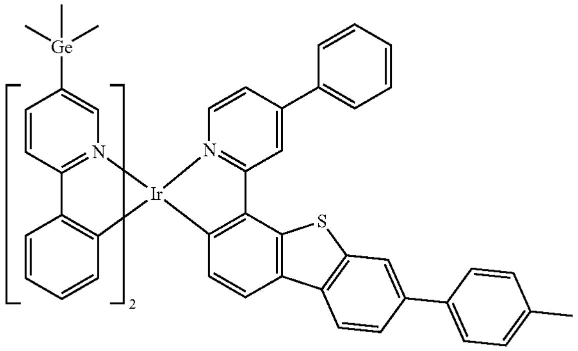
2092
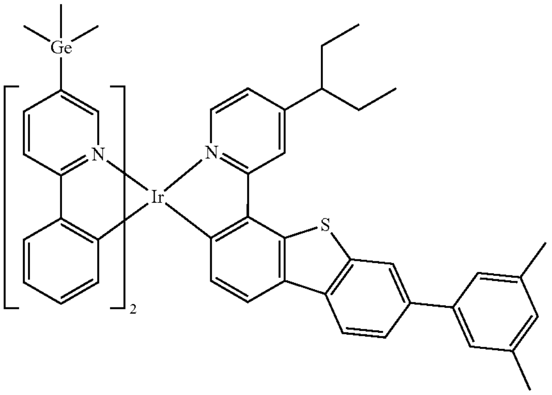
2093
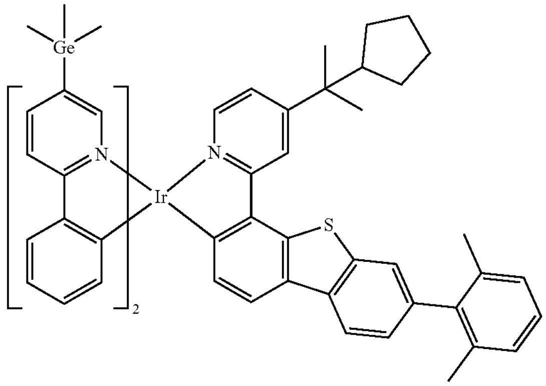

-continued
2094
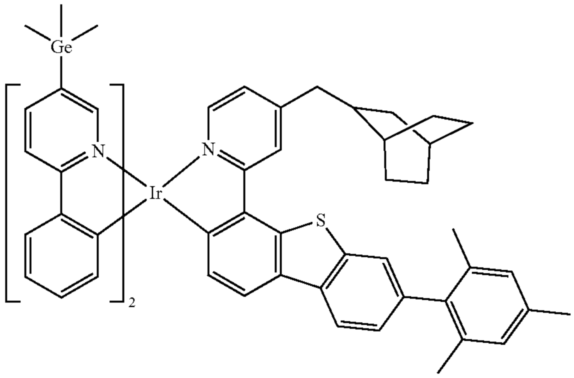
2095
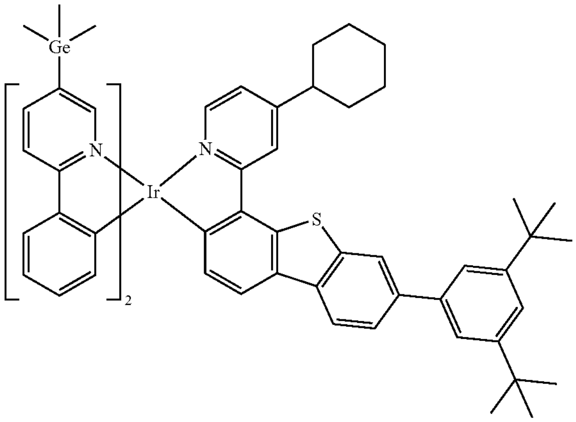
2096
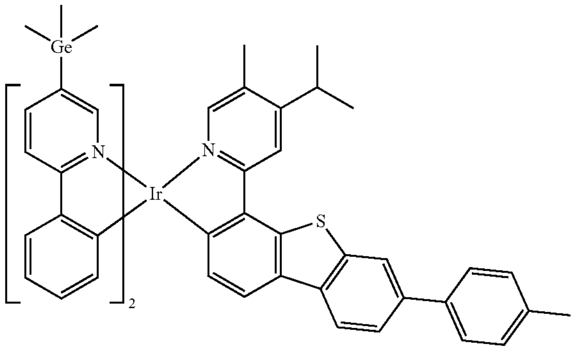
2097
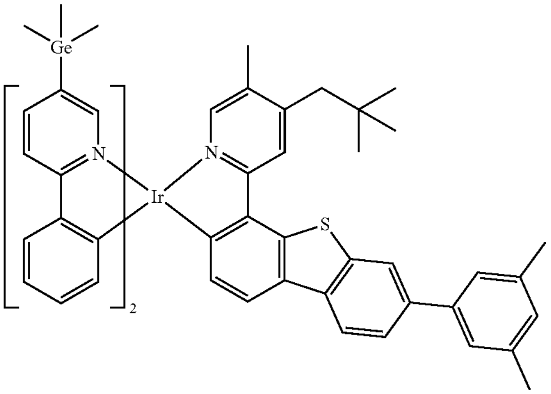
2098
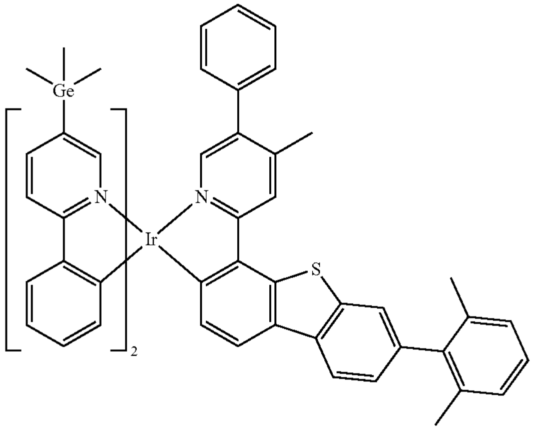
2099
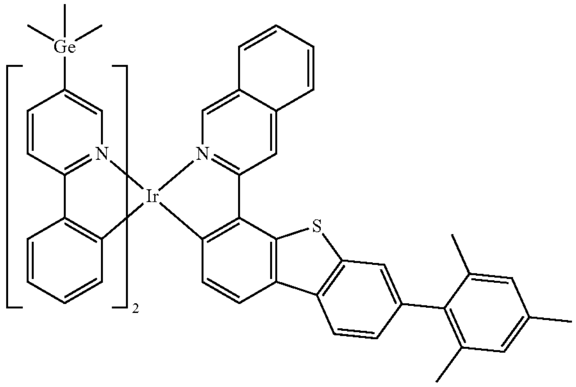
2100
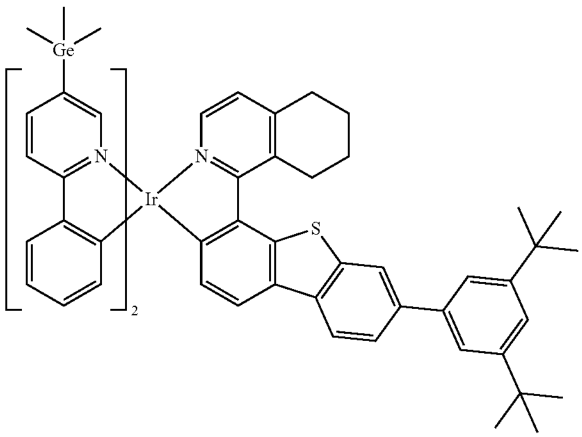

-continued
2101
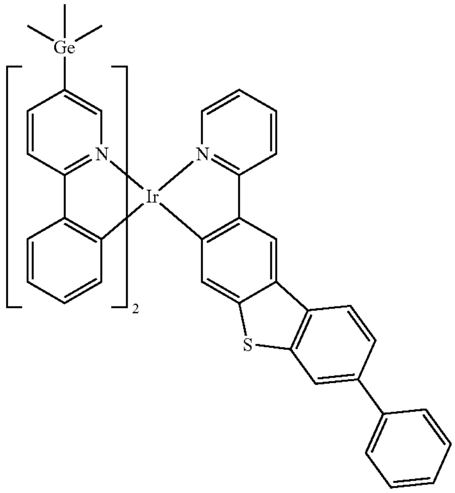
2102
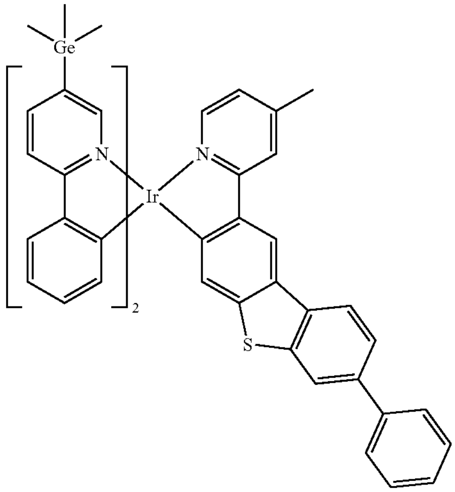
2103
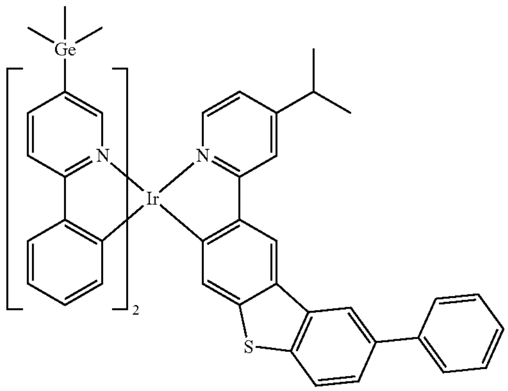
-continued
2104
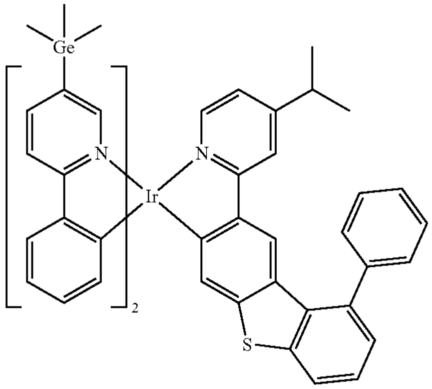
2105
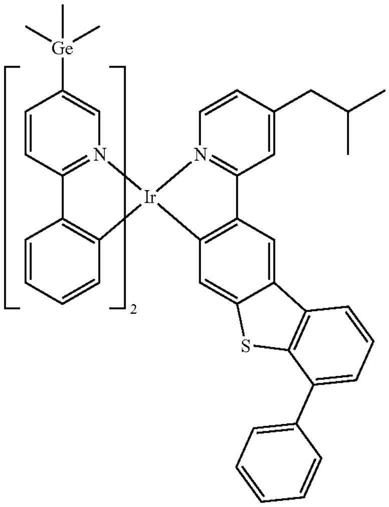
2106
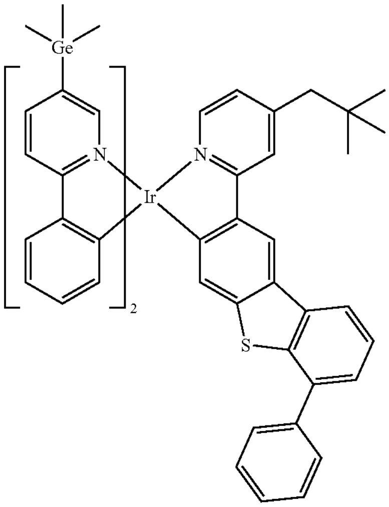

-continued
2107
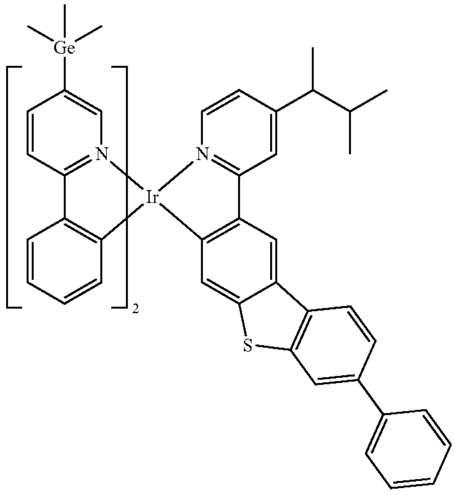
2108
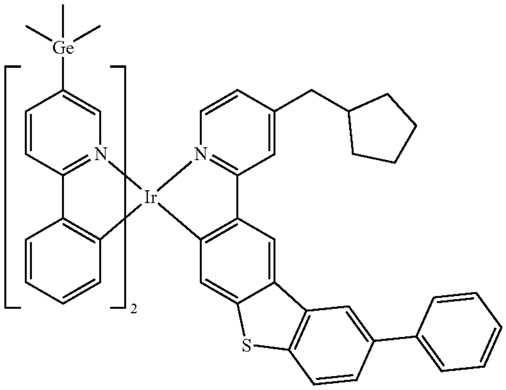
2109
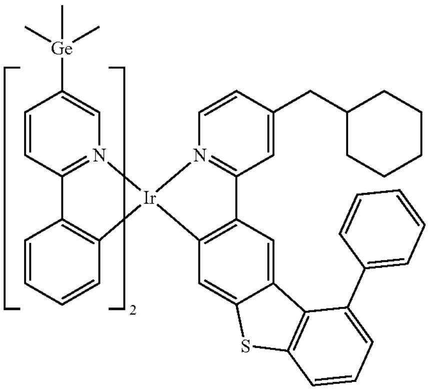
-continued
2110
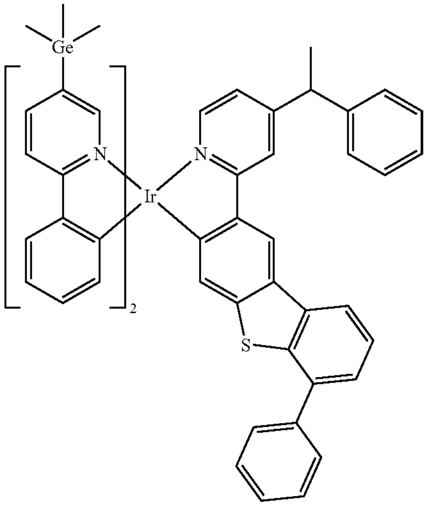
2111
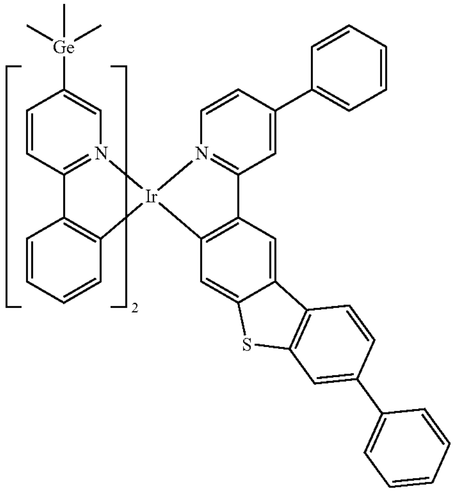
2112
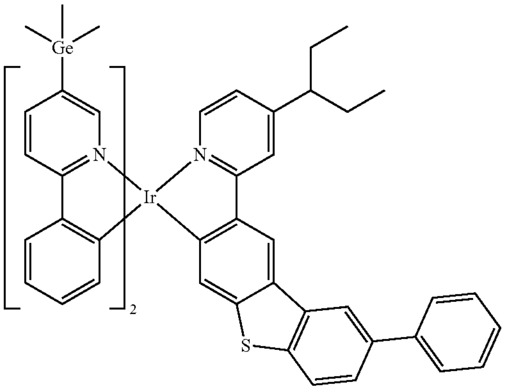

2113
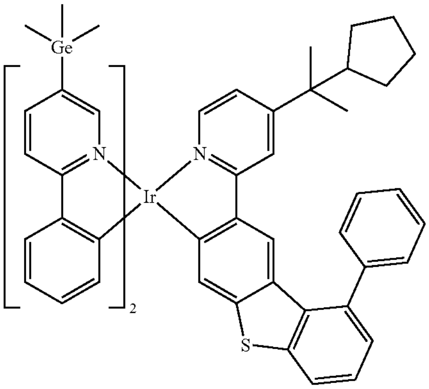
2114
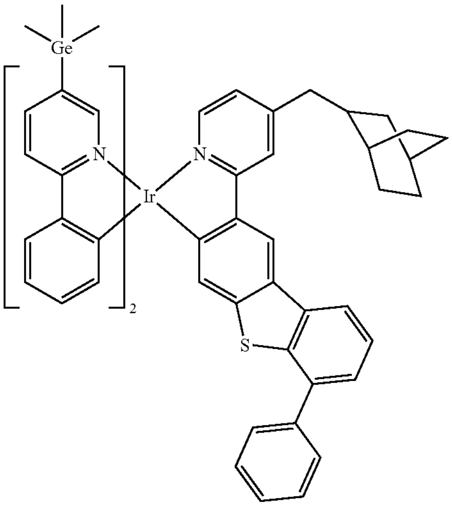
2115
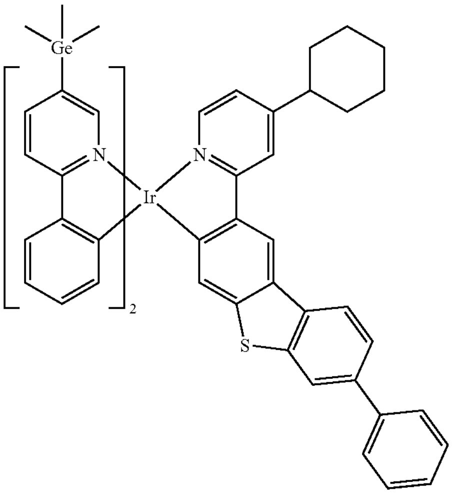
2116
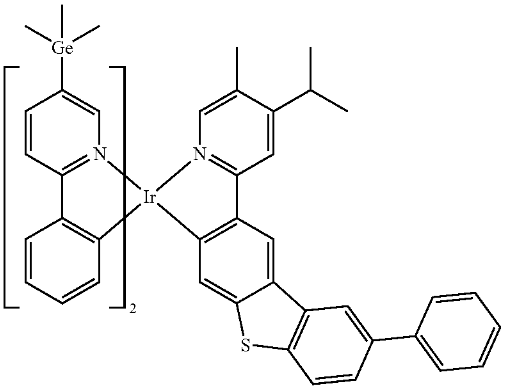
2117
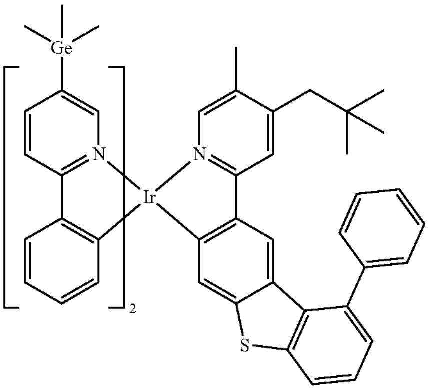
2118
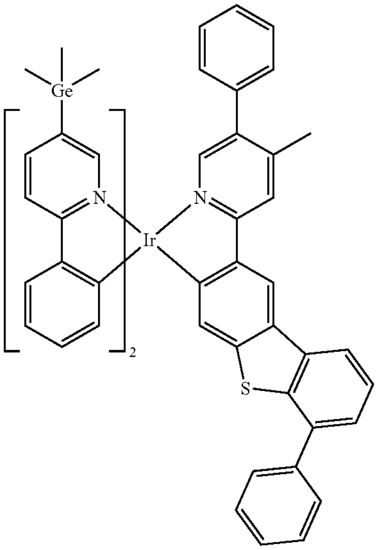

-continued
2119
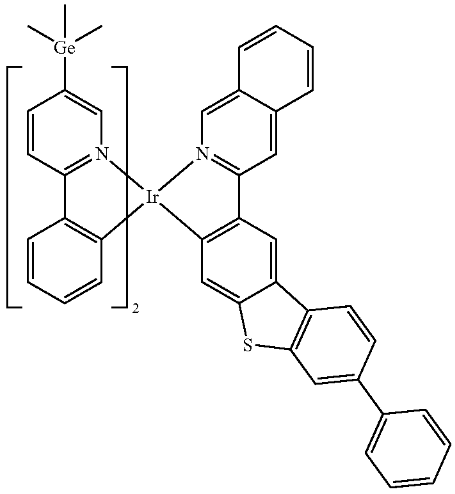
2120
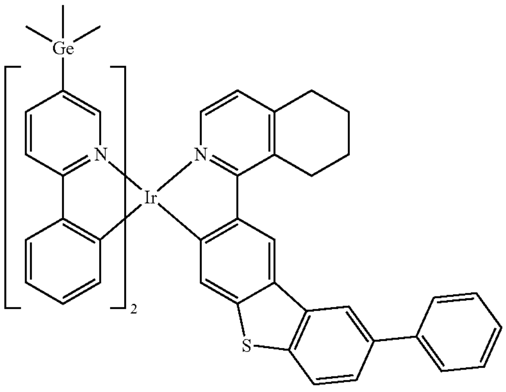
2121
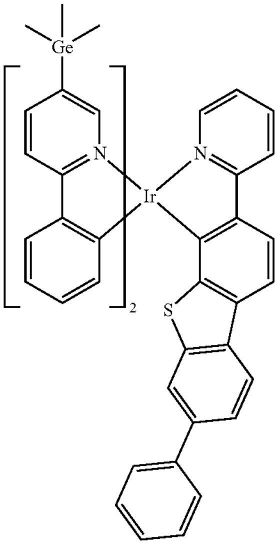
-continued
2122
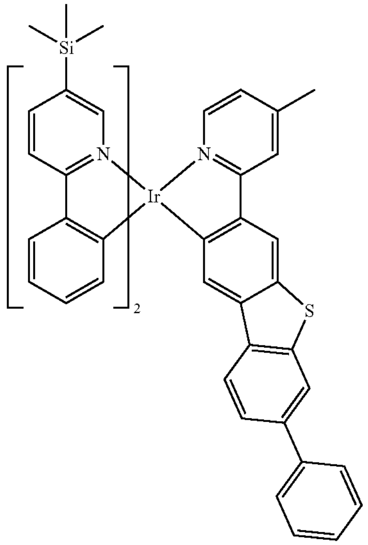
2123
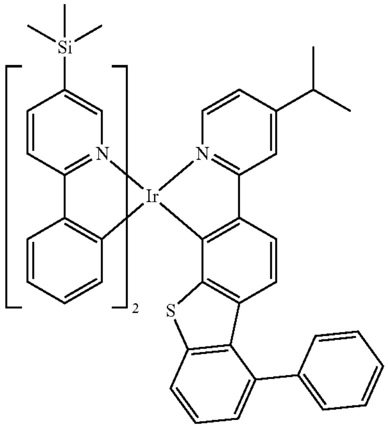
2124
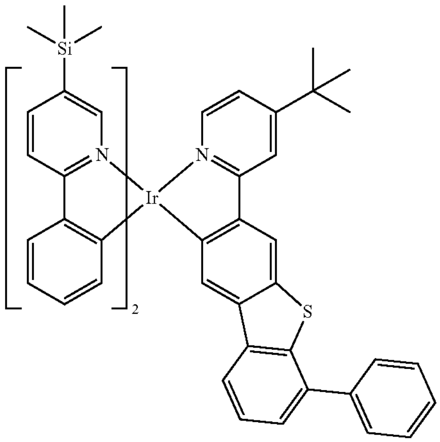

-continued
2125
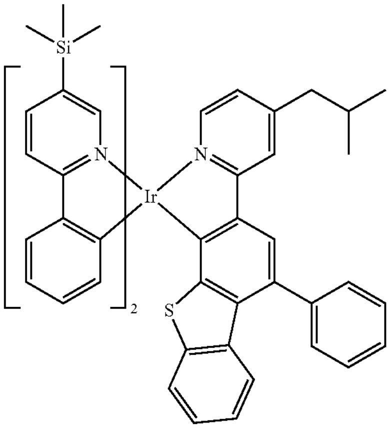
2126
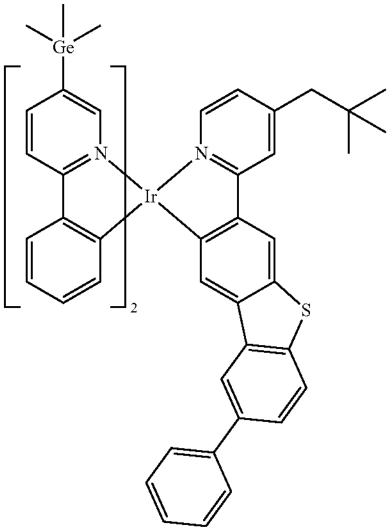
2127
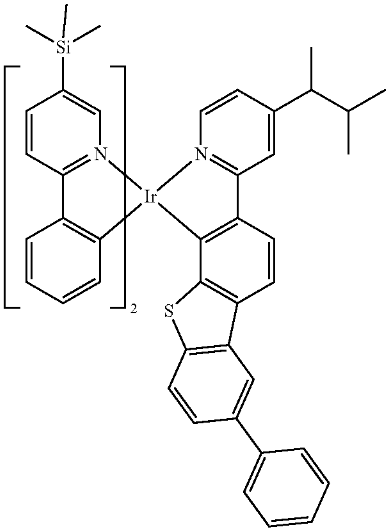
-continued
2128
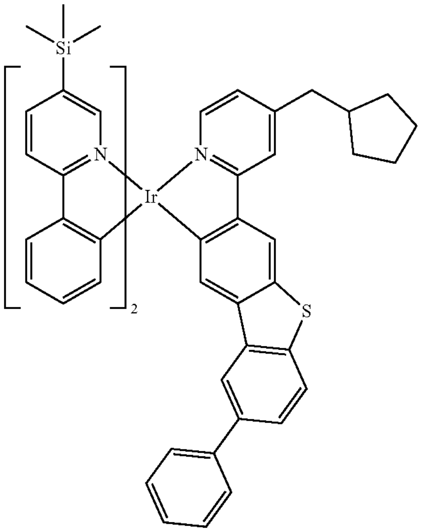
2129
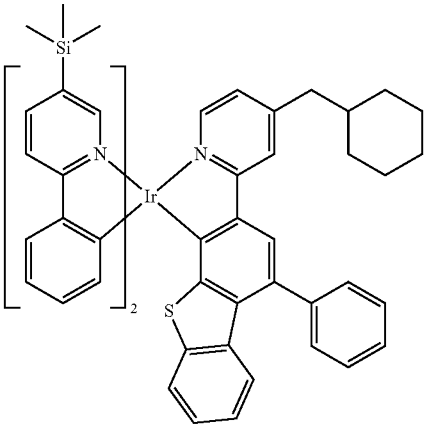
2130
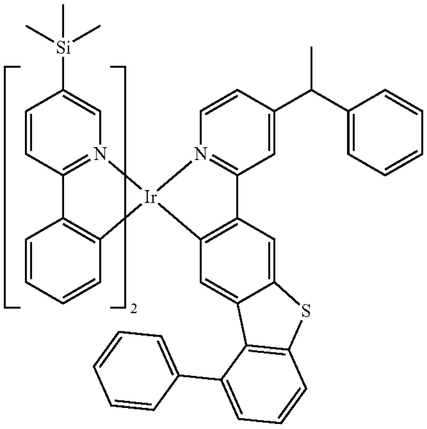

-continued
2131
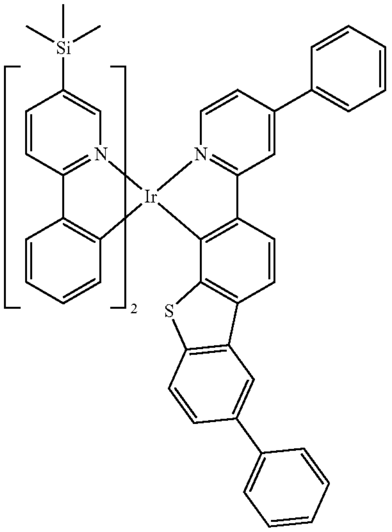
2132
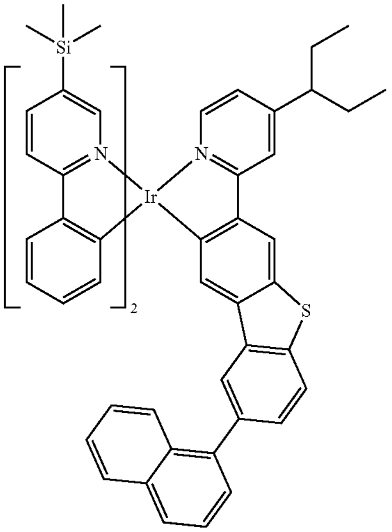
2133
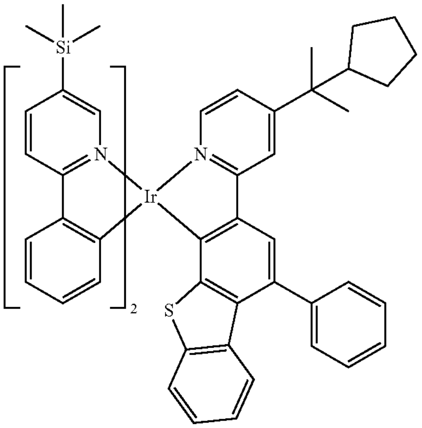
-continued
2134
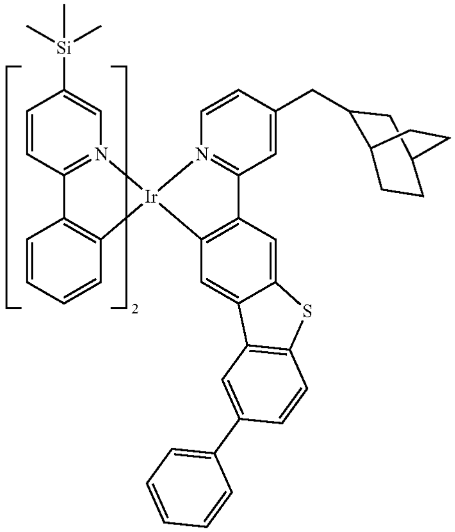
2135
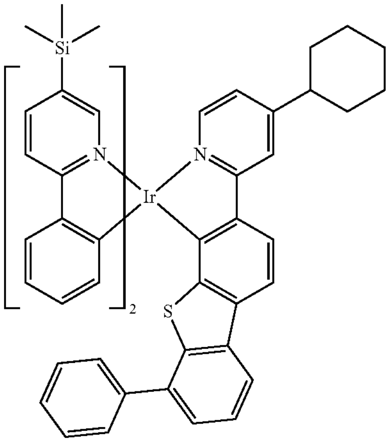
2136
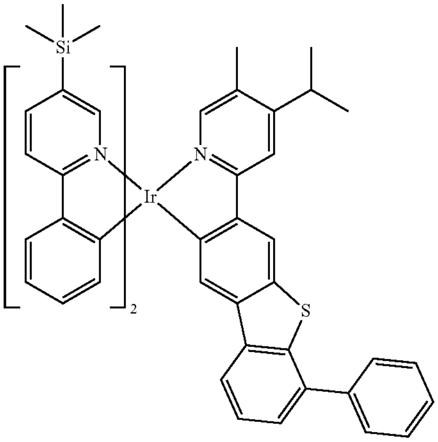

-continued
2137
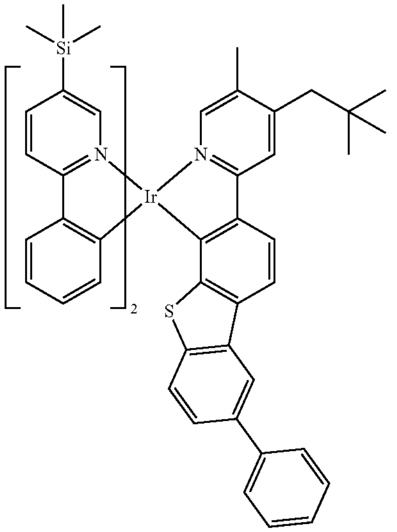
2138
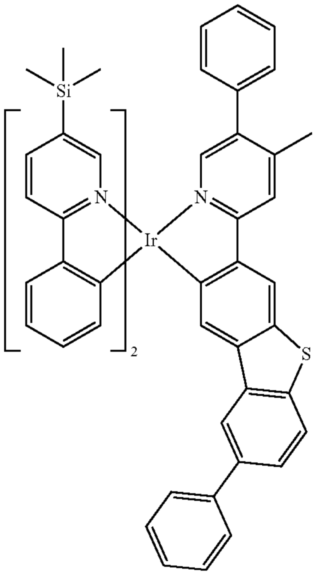
2139
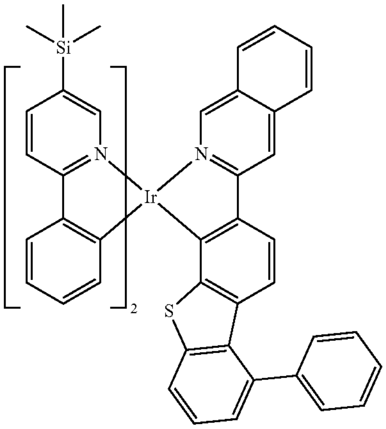
-continued
2140
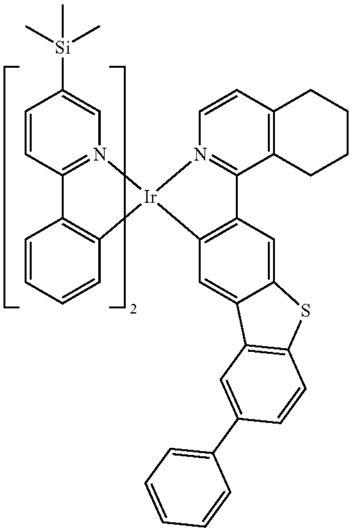
2041
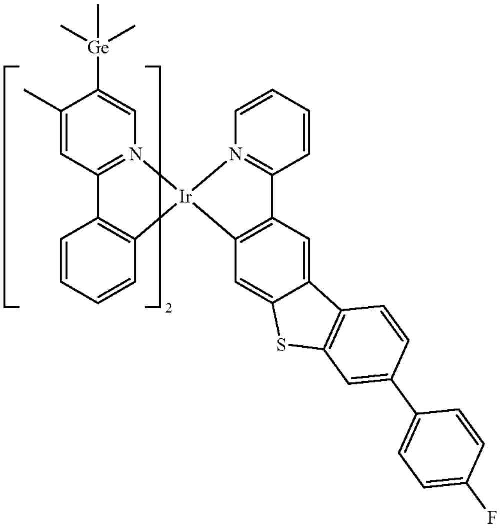
2142
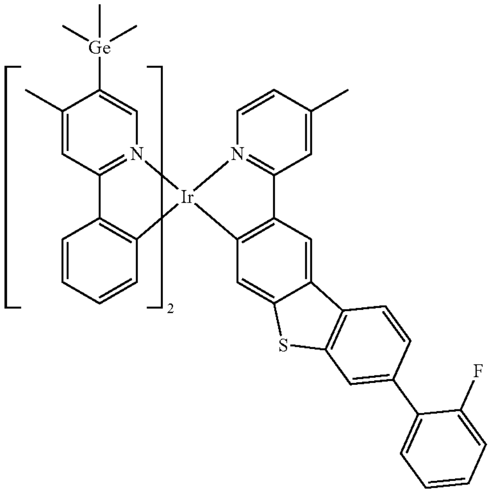

-continued
2143
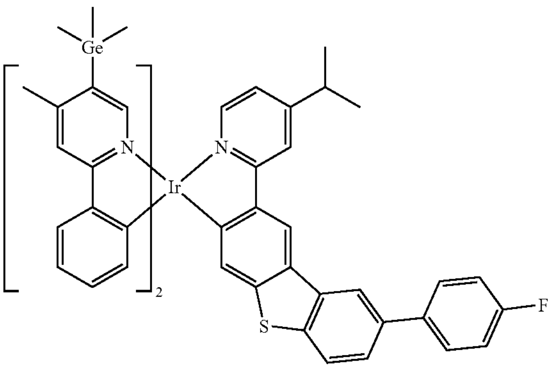
2144
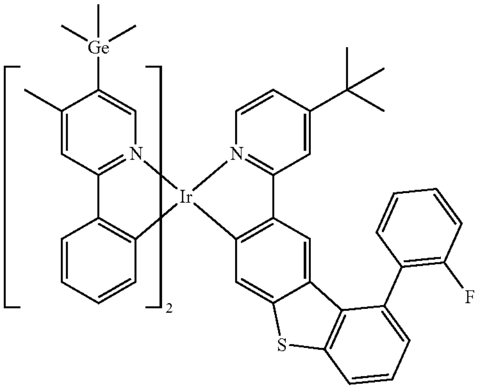
2145
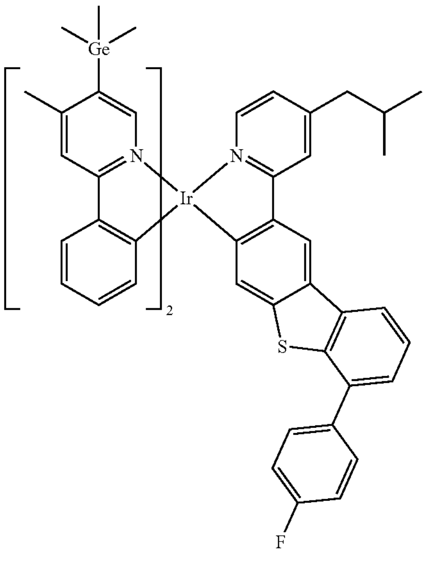
-continued
2146
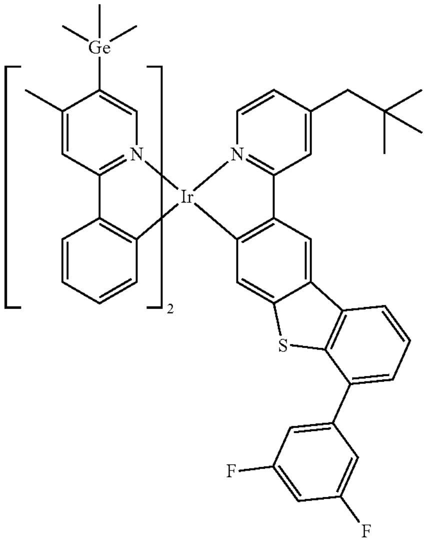
2147
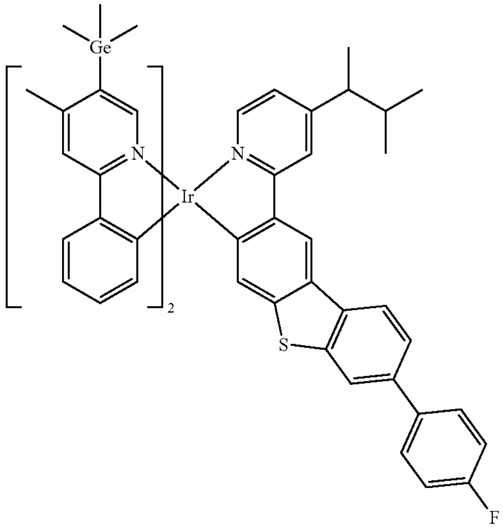
2148
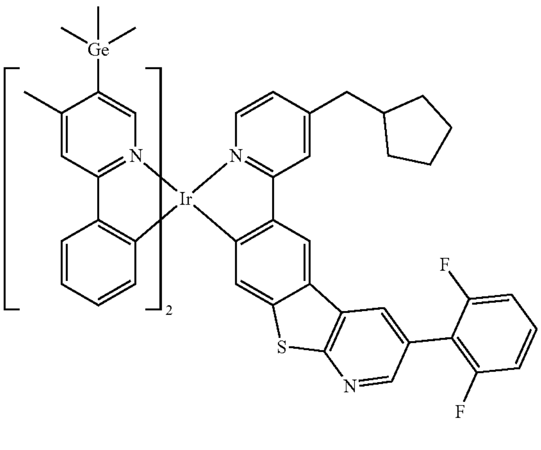

-continued
2149
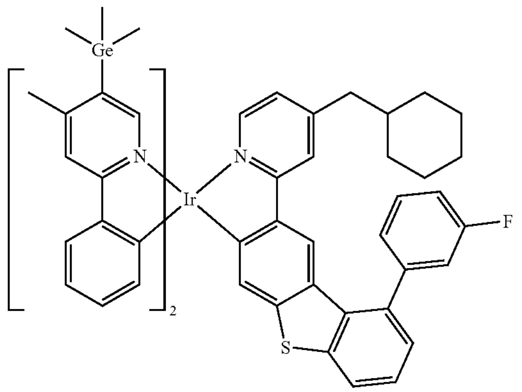
2150
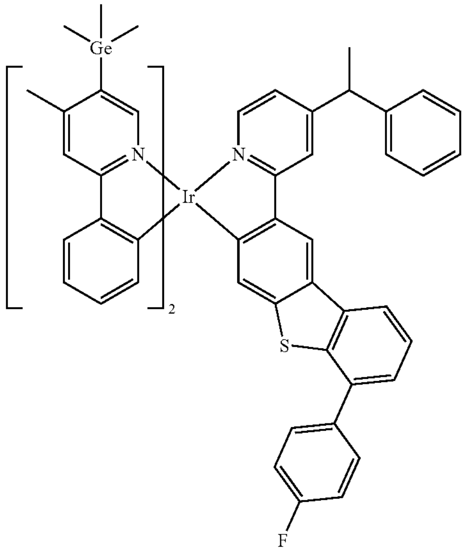
2151
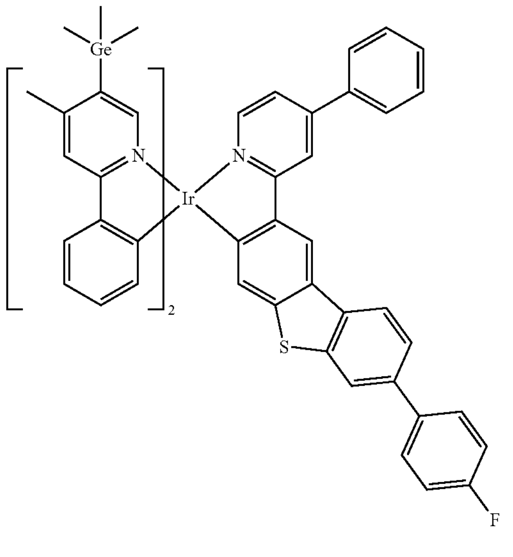
-continued
2152
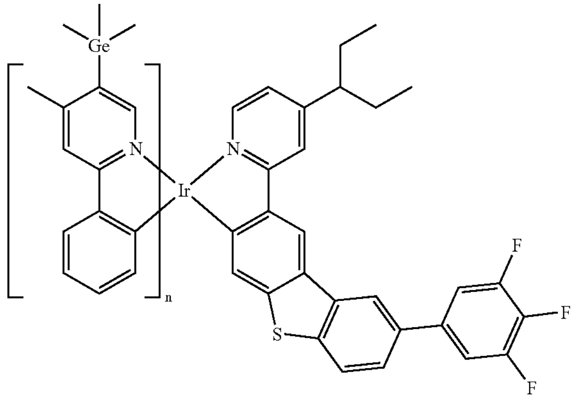
2153
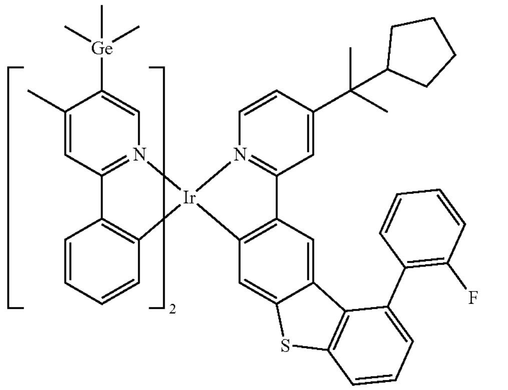
2154
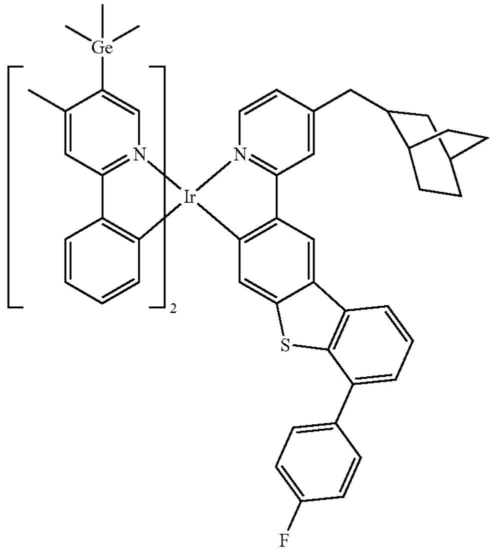

-continued
2155
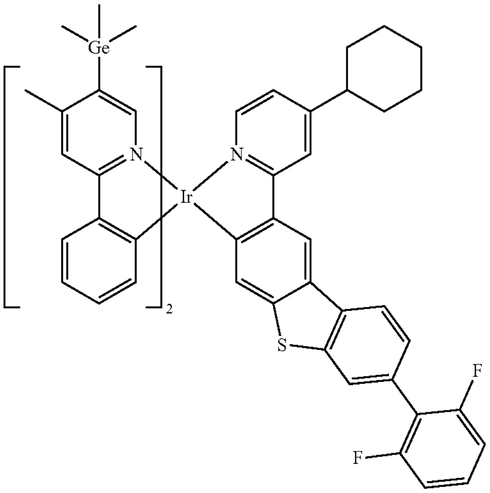
2156
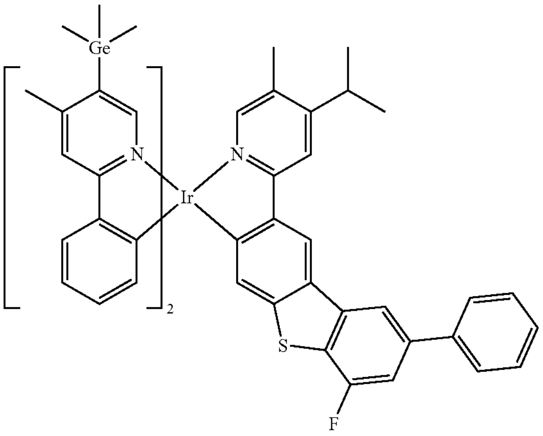
2157
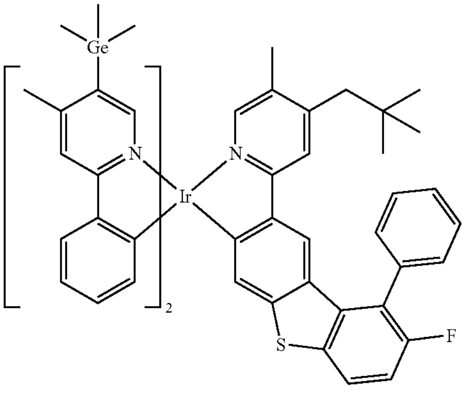
-continued
2158
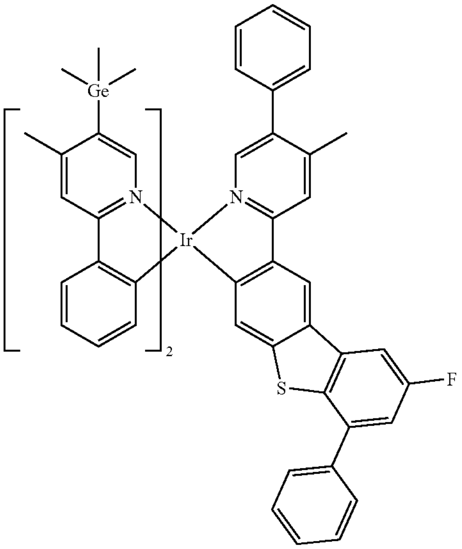
2159
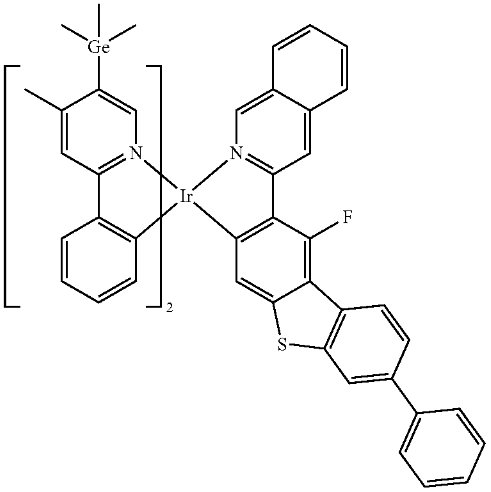
2160
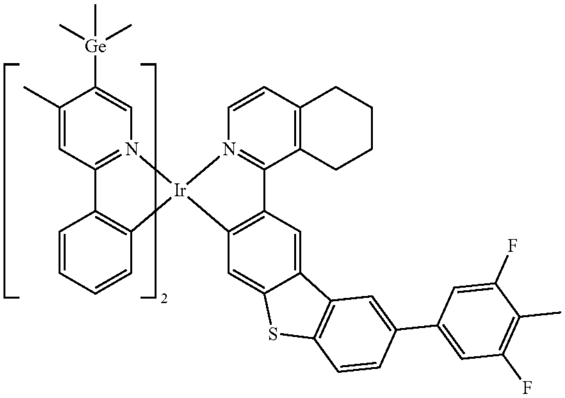

-continued
2161
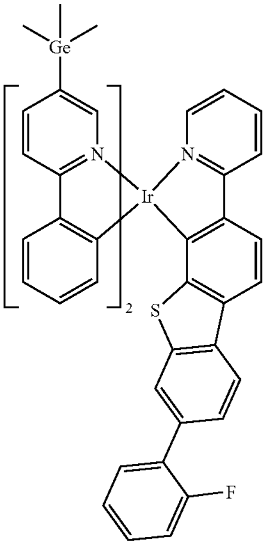
2162
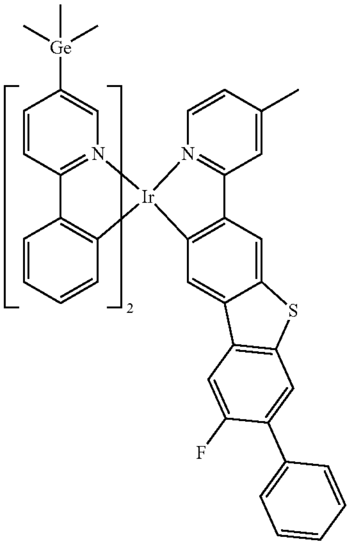
2163
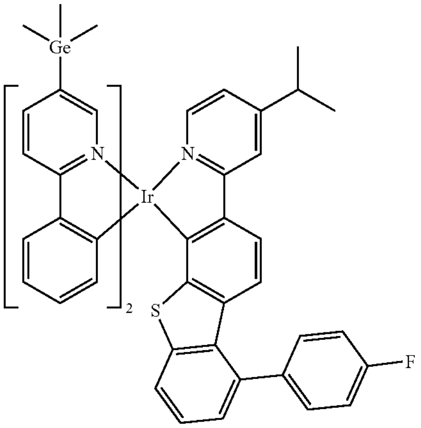
2164
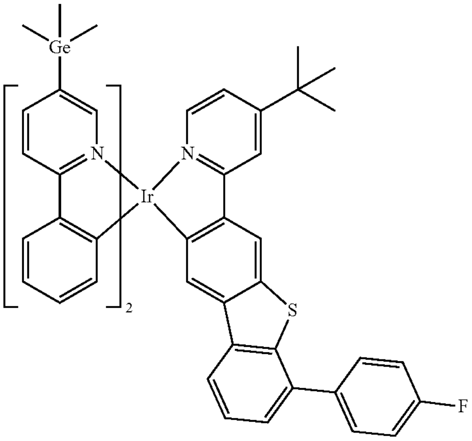
2165
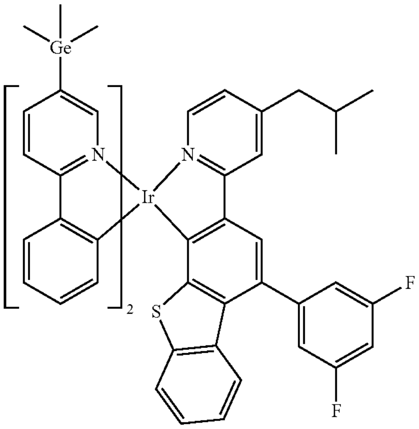
2166
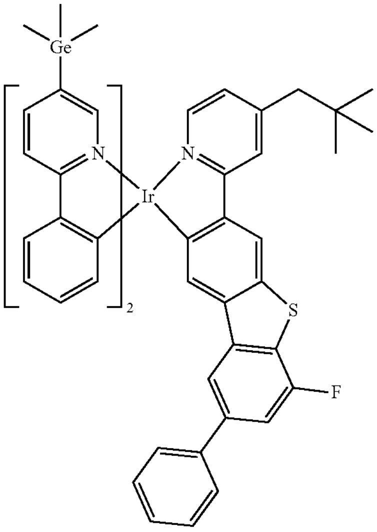

2167
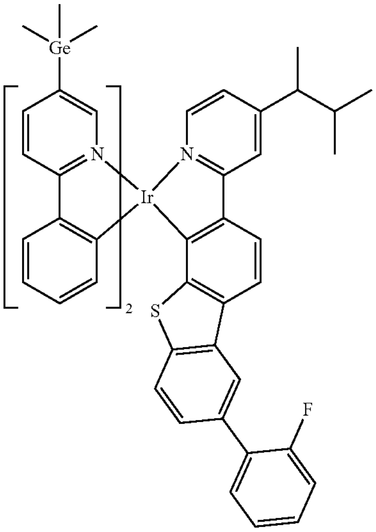
2168
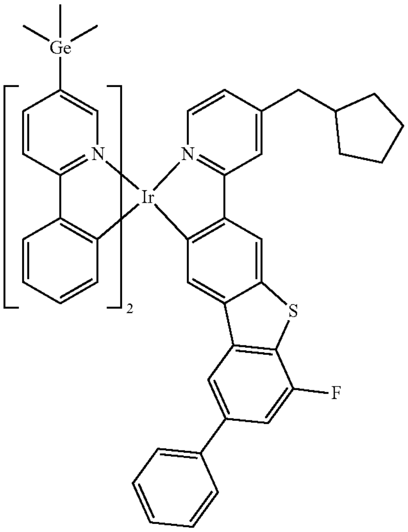
2169
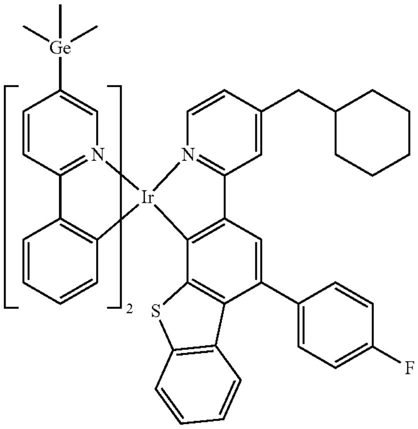
2170
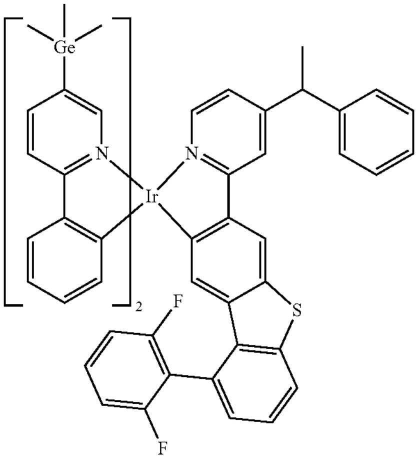
2171
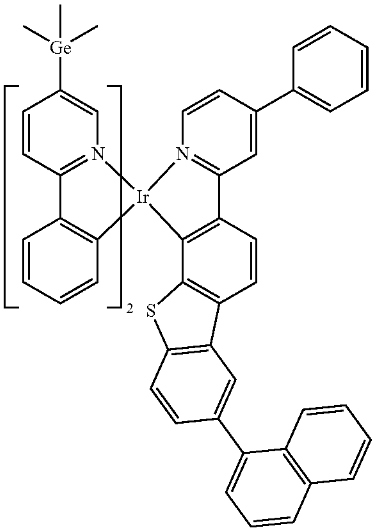
2172
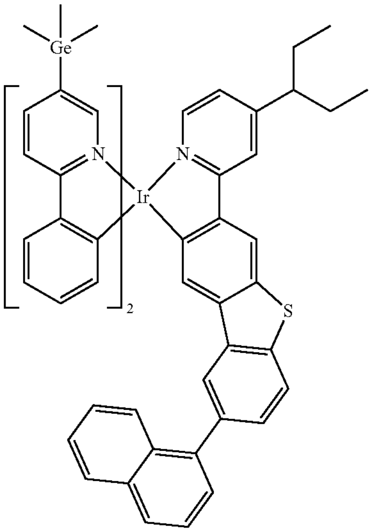

-continued
2173
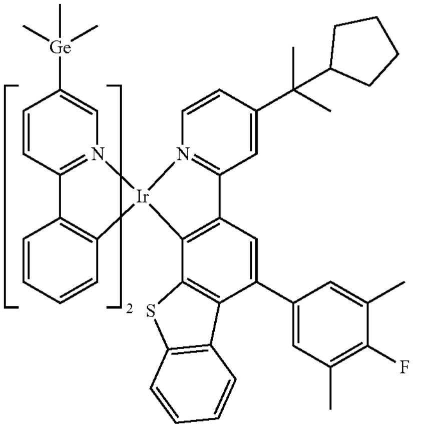
2174
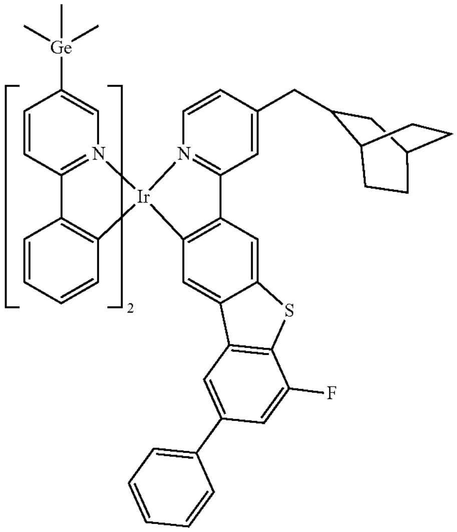
2175
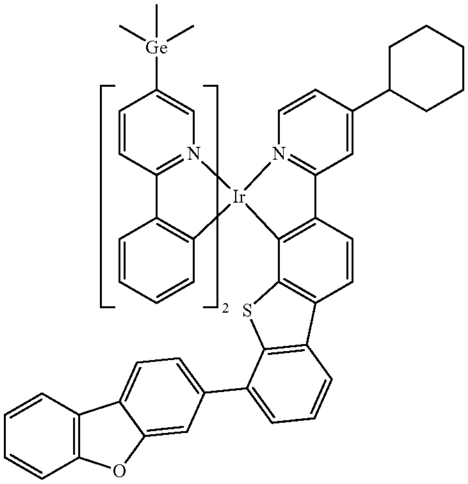
-continued
2176
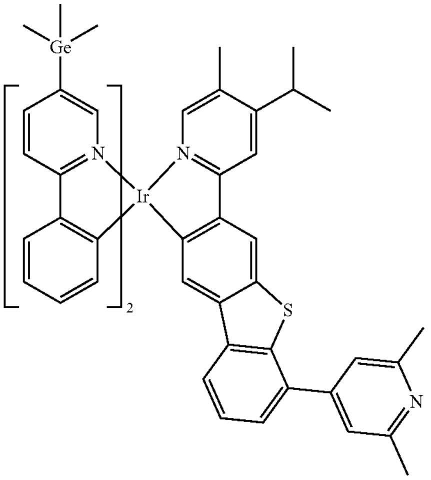
2177
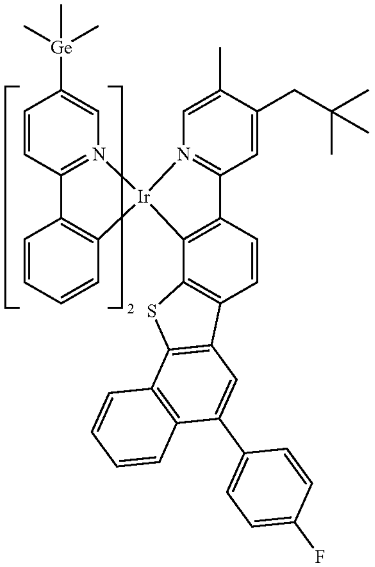
2178
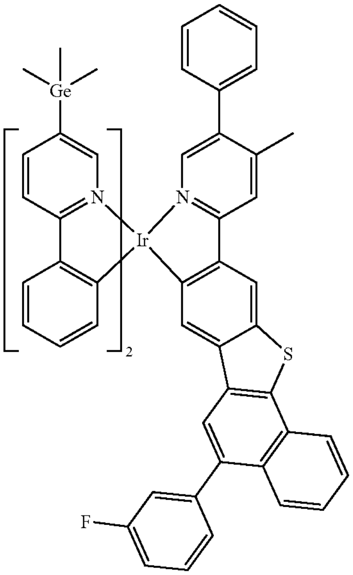

-continued
2179
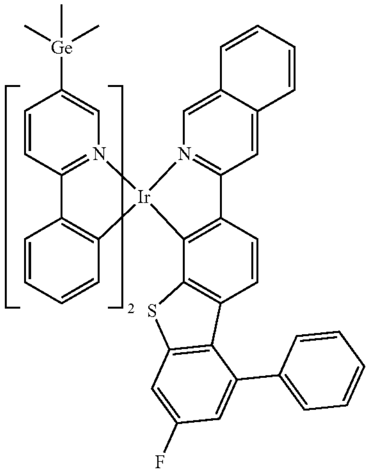
2180
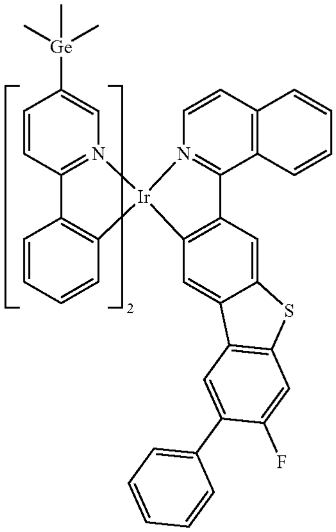
2181
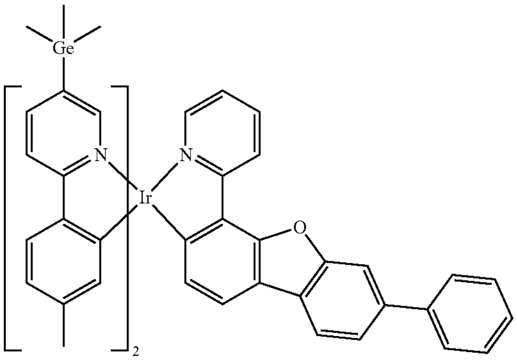
-continued
2182
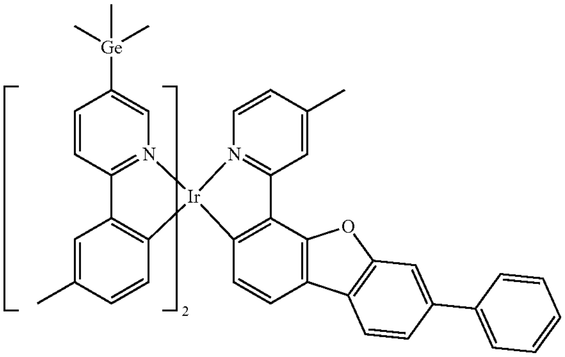
2183
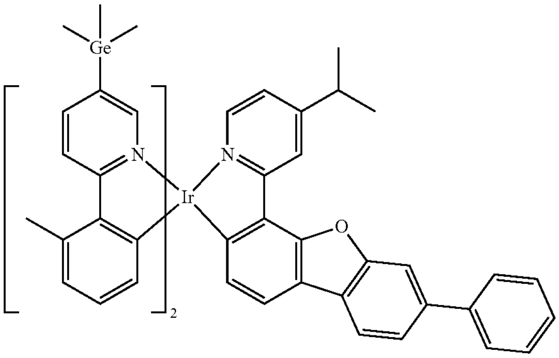
2184
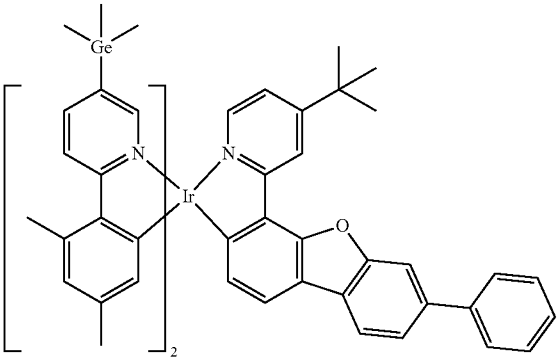
2185
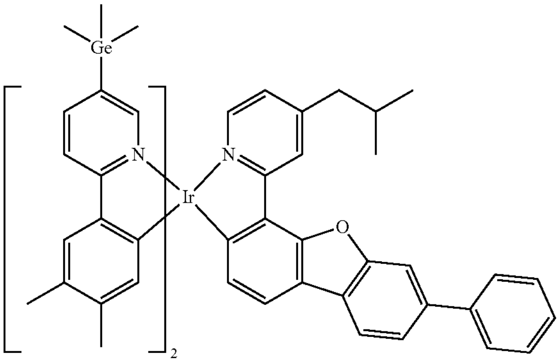

-continued
2186
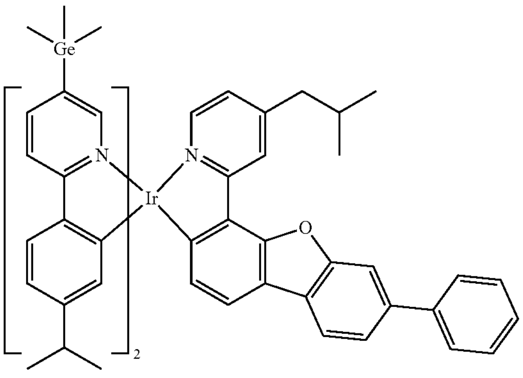
2187
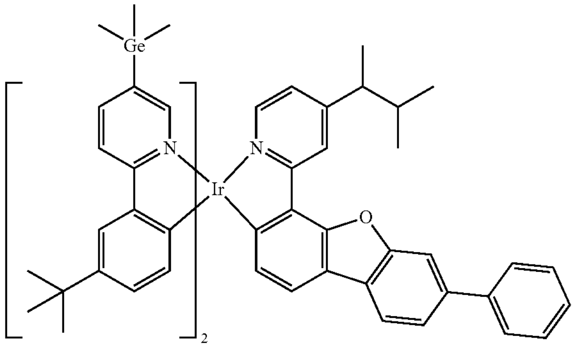
2188
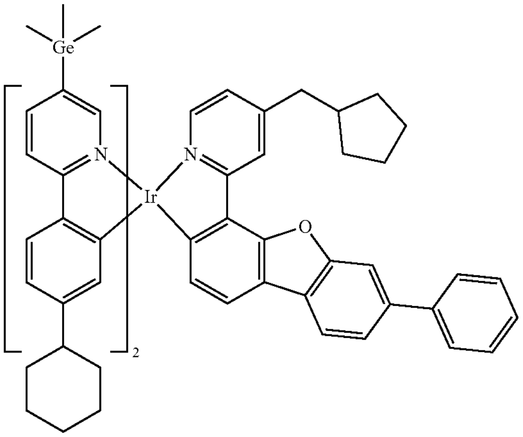
2189
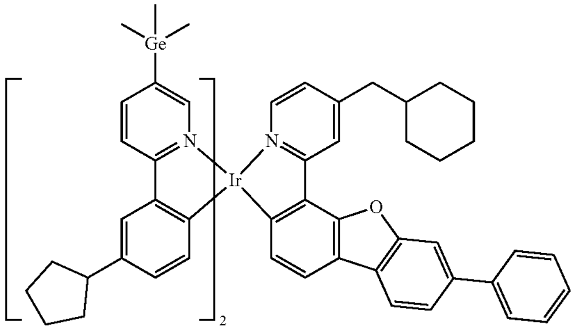
-continued
2190
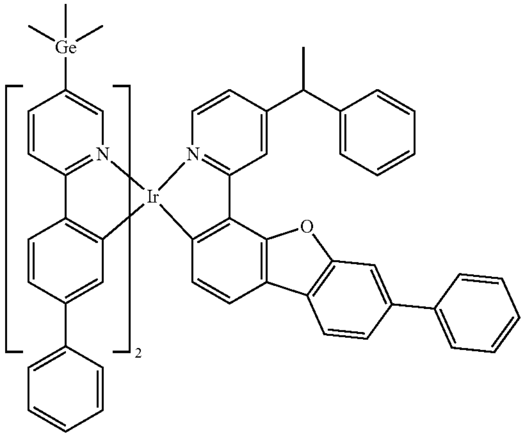
2191
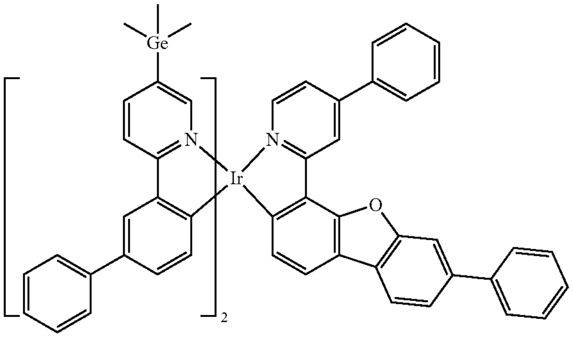
2192
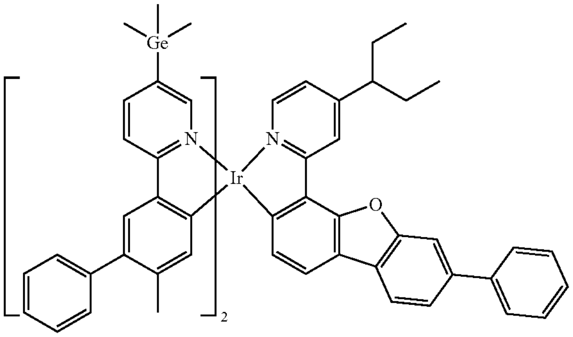
2193
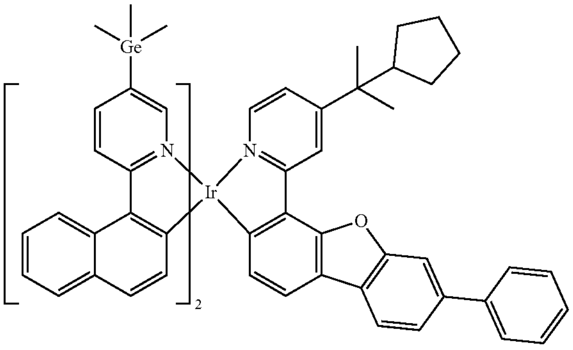

-continued
2194
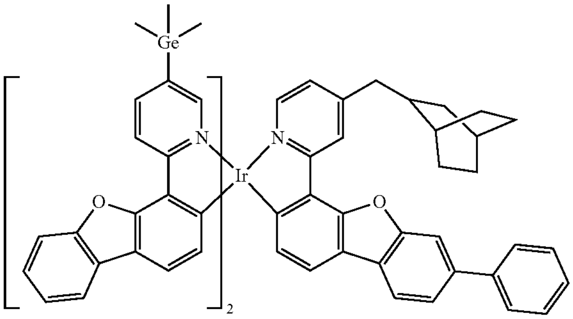
2195
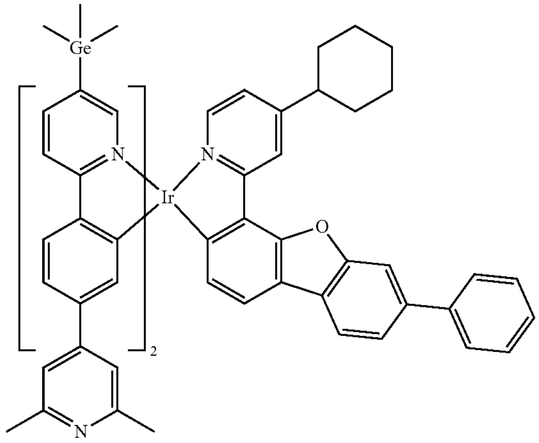
2196
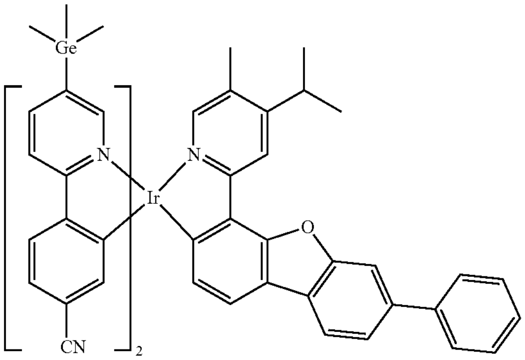
2197
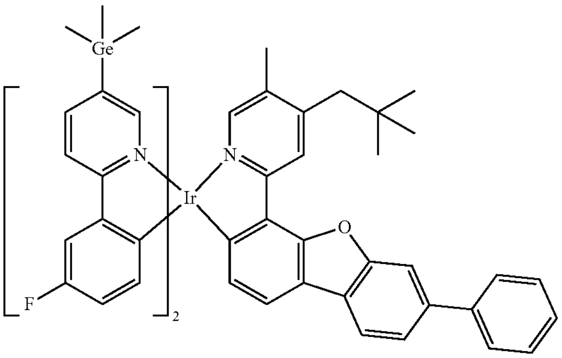
-continued
2198
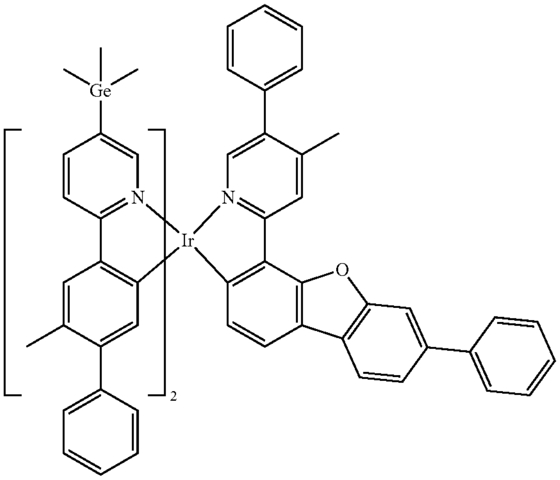
2199
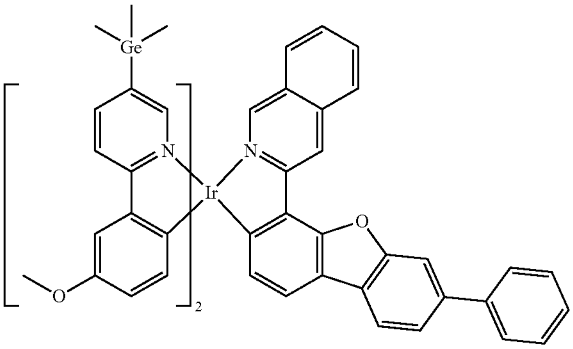
2200
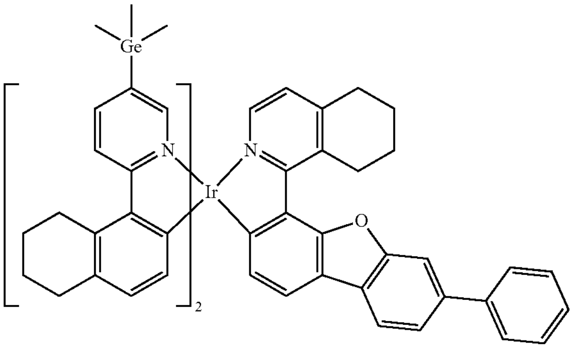
2201
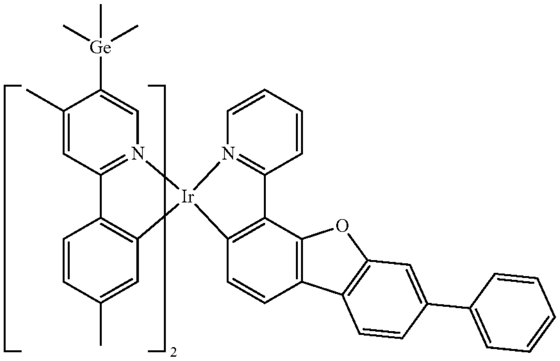

-continued
2202
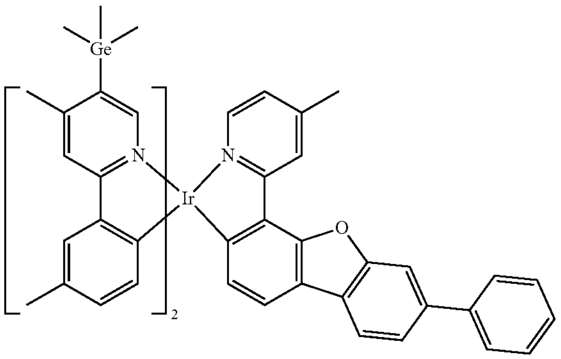
2203
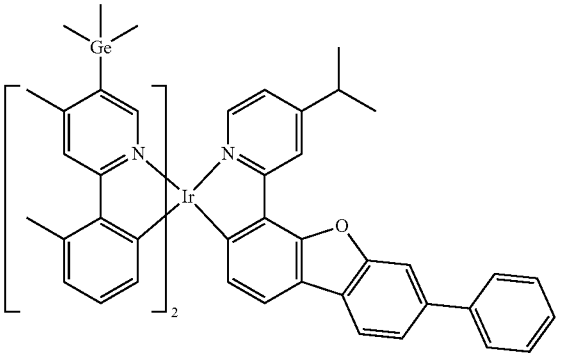
2204
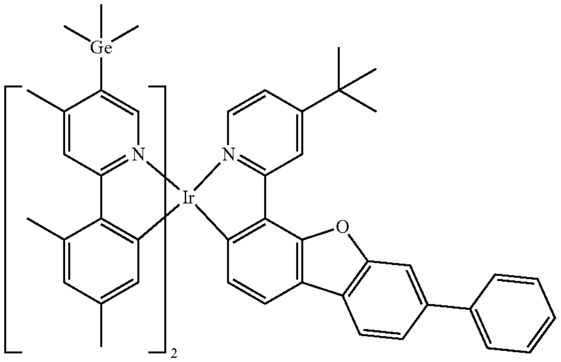
2205
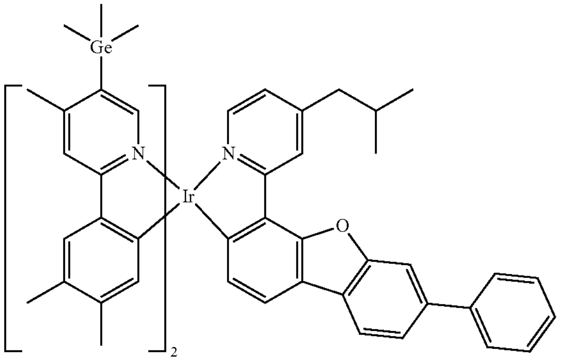
2206
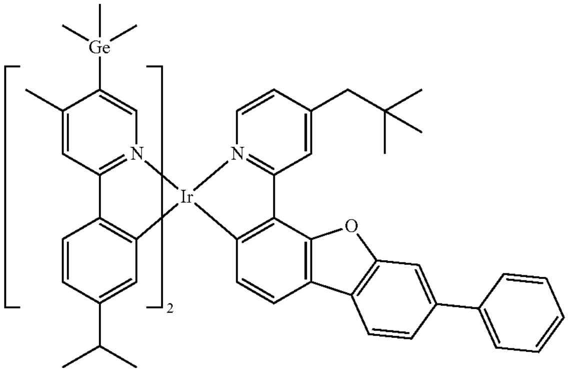
2207
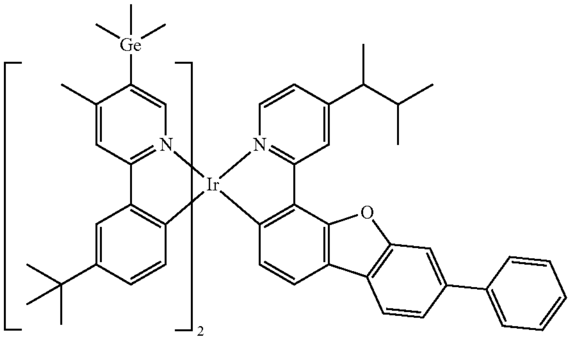
2208
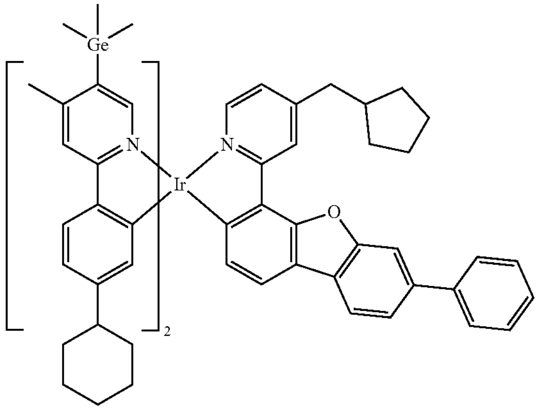
2209
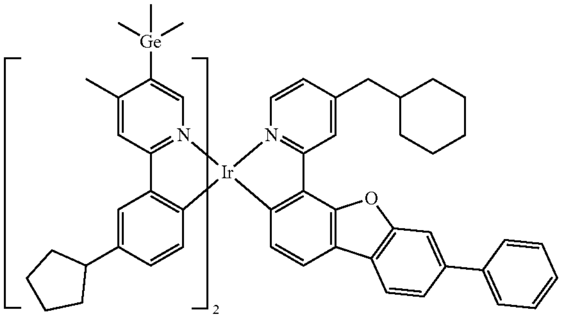

2210
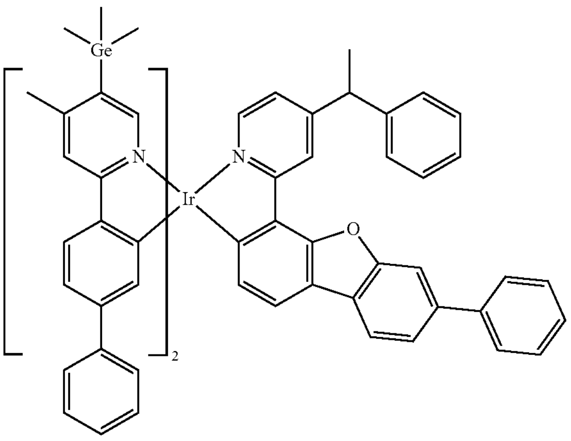
2211
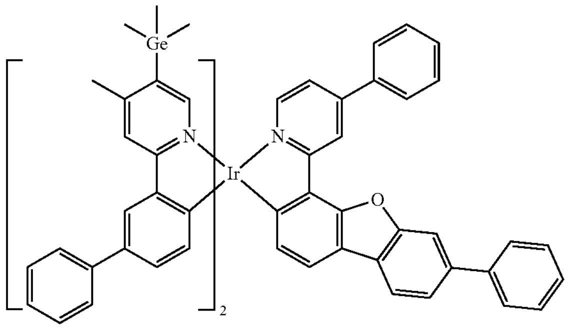
2212
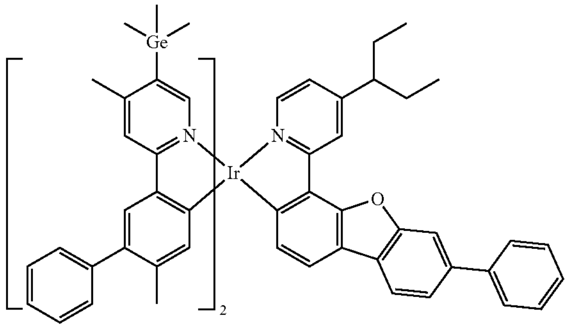
2213
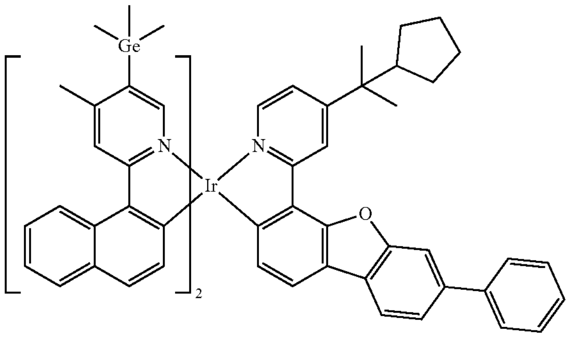
2214
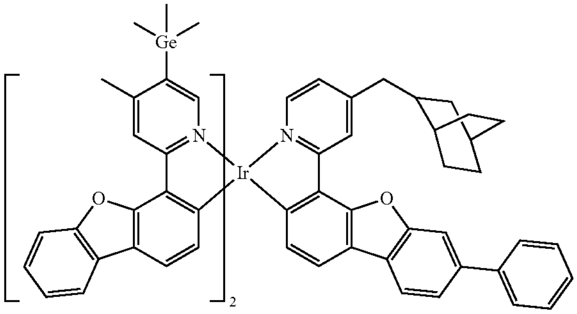
2215
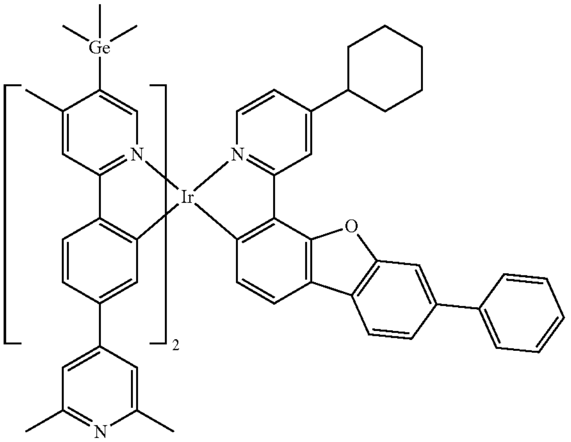
2216
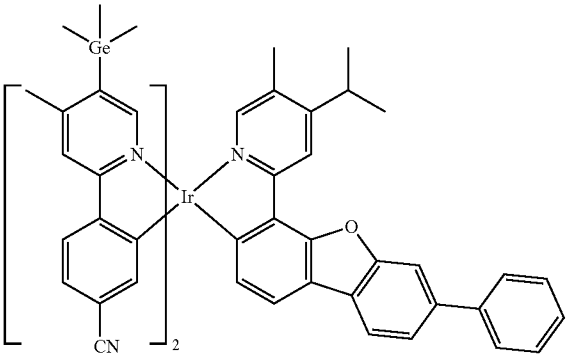
2217
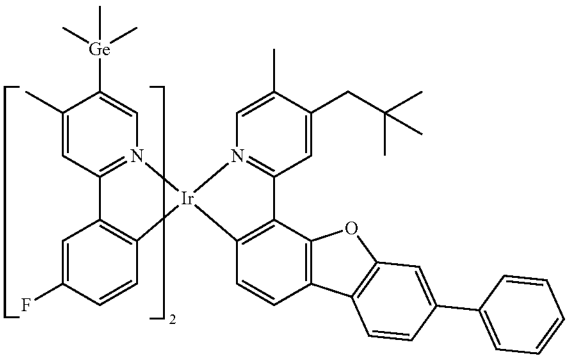

-continued
2218
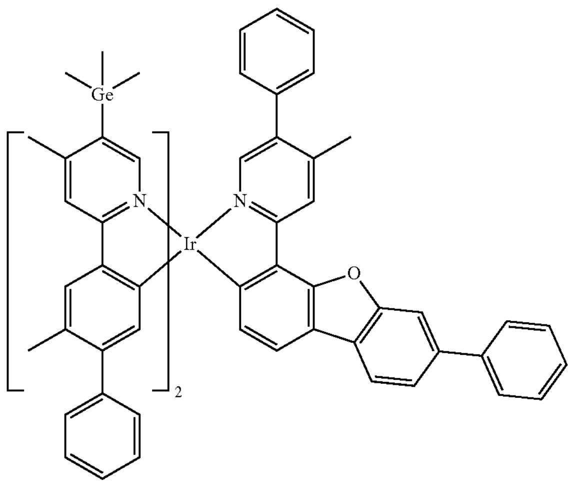
2219
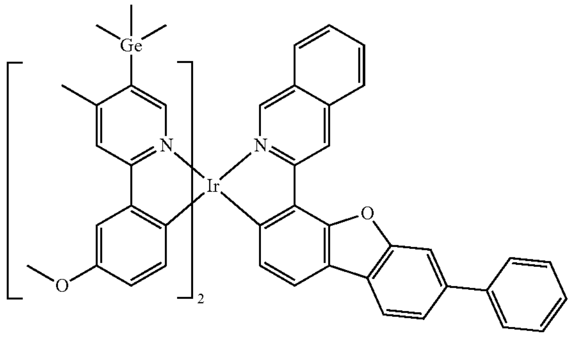
2220
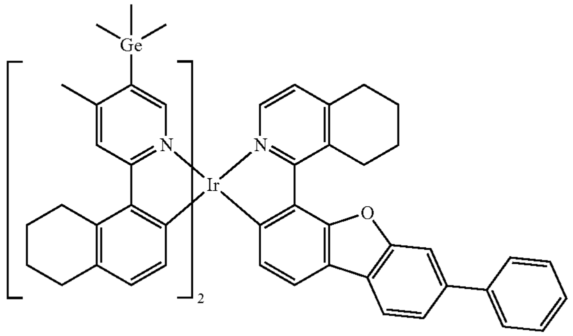
2221
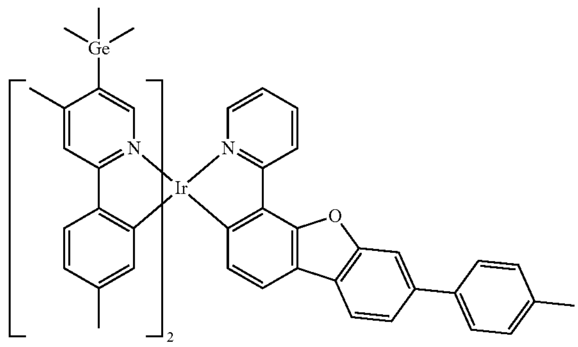
-continued
2222
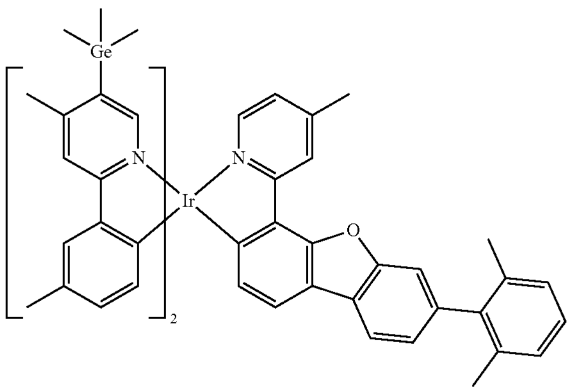
2223
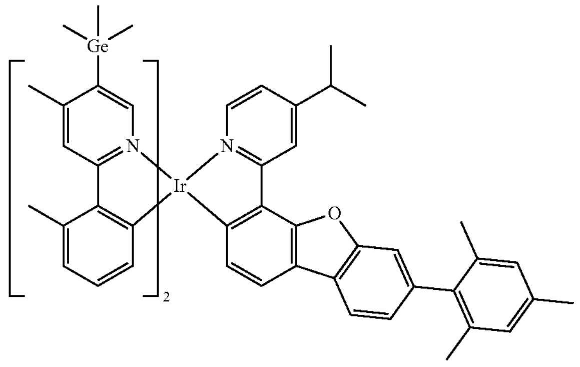
2224
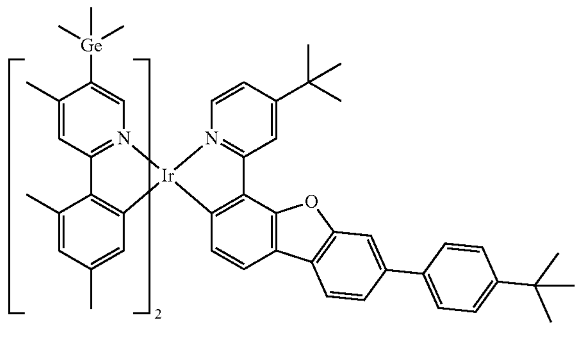
2225
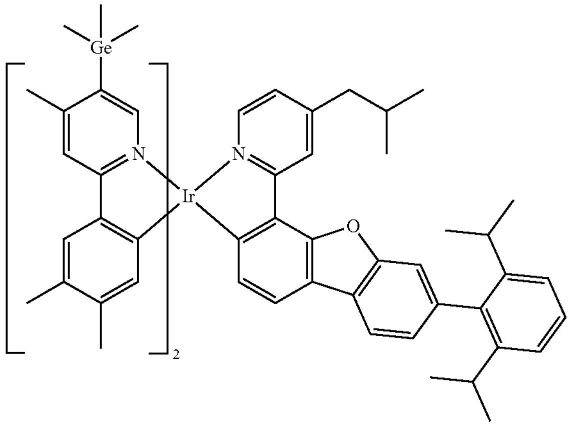

-continued
2226
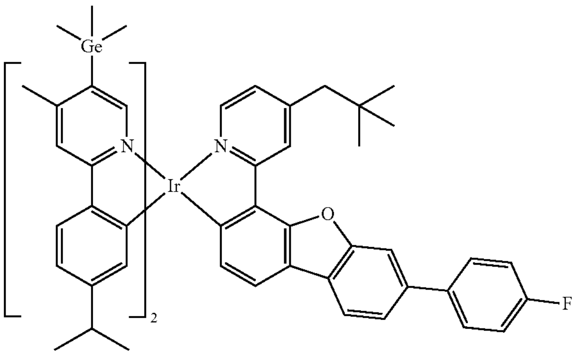
2227
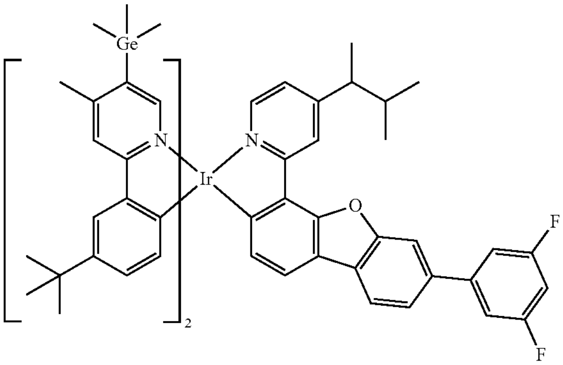
2228
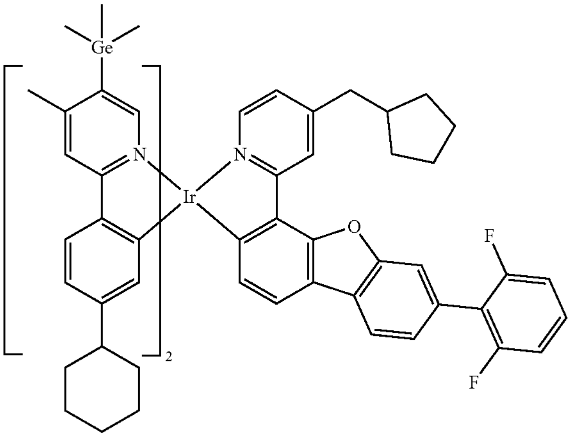
2229
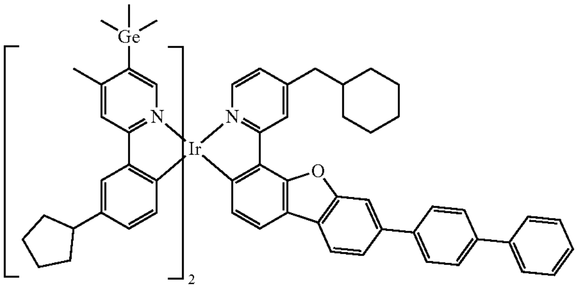
-continued
2230
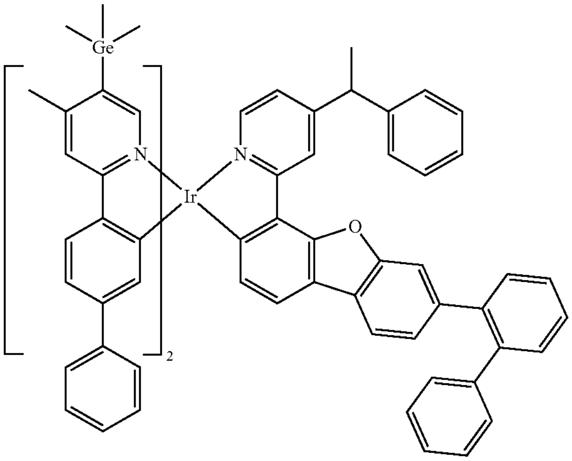
2231
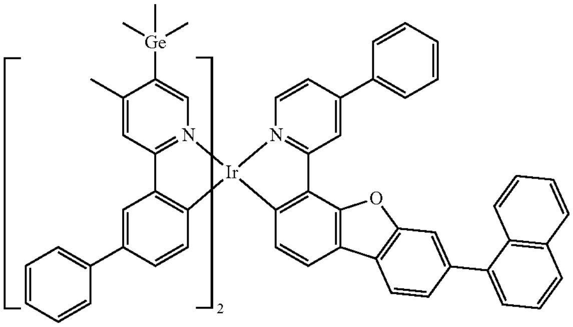
2232
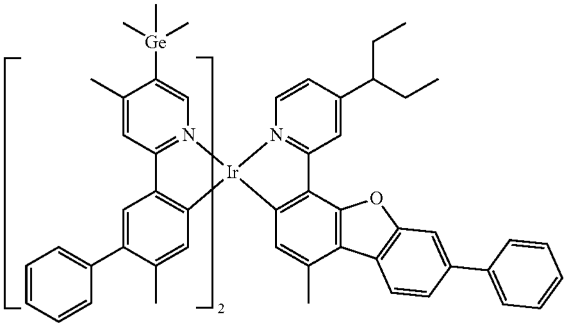
2233
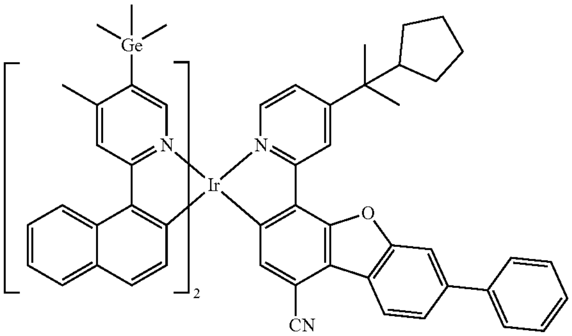

-continued
2234
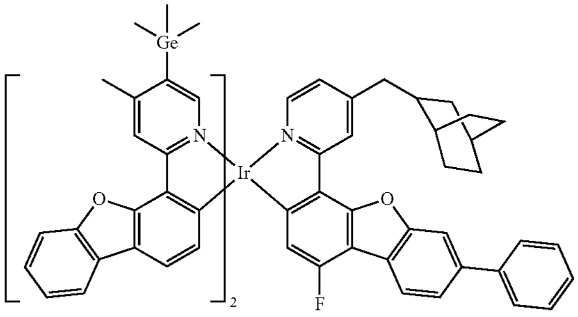
2235
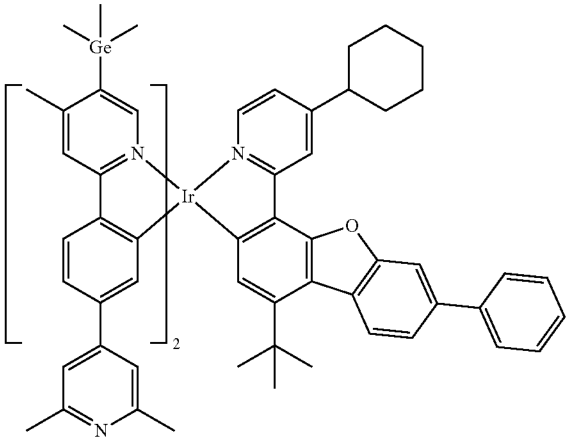
2236
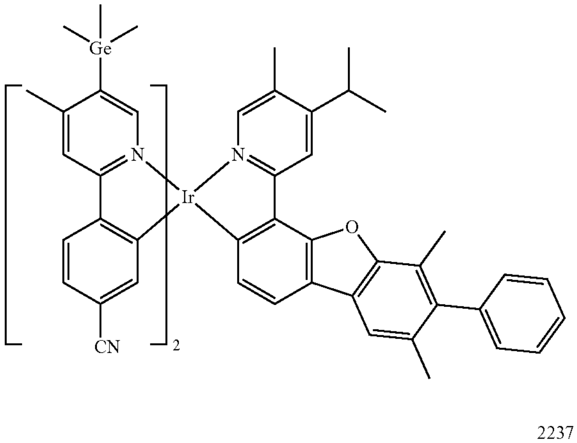
2237
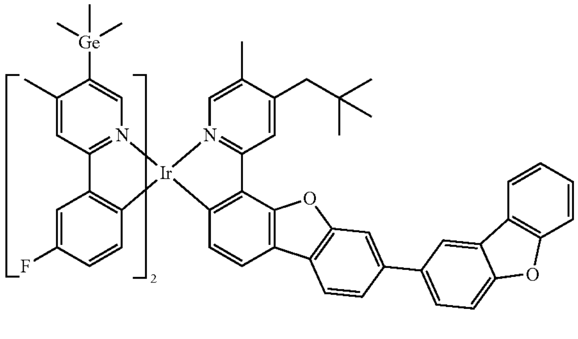
-continued
2238
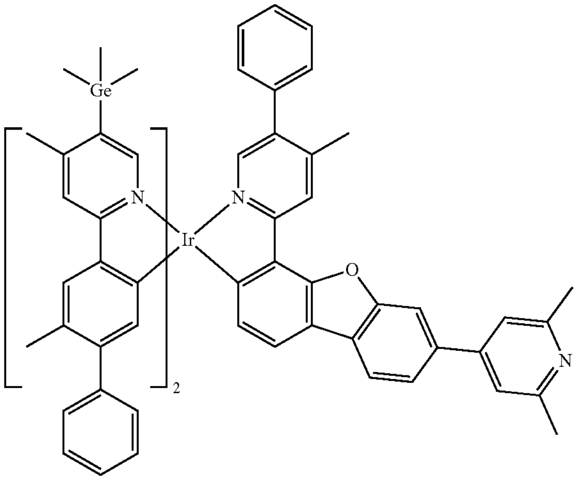
2239
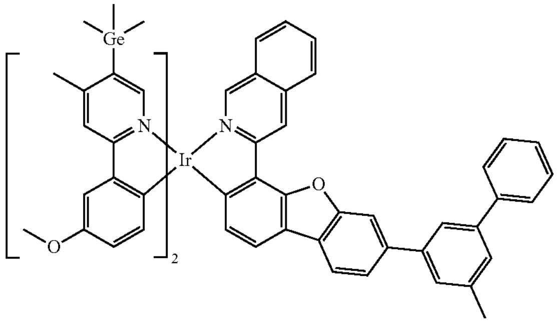
2240
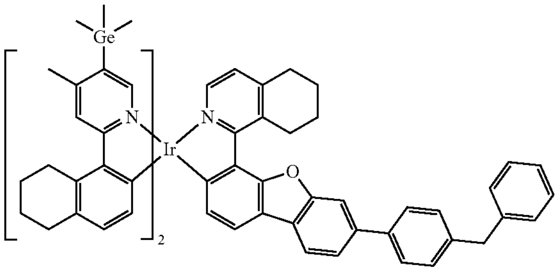
2241
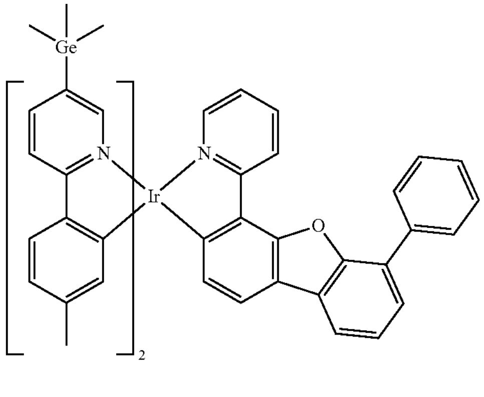

-continued
2242
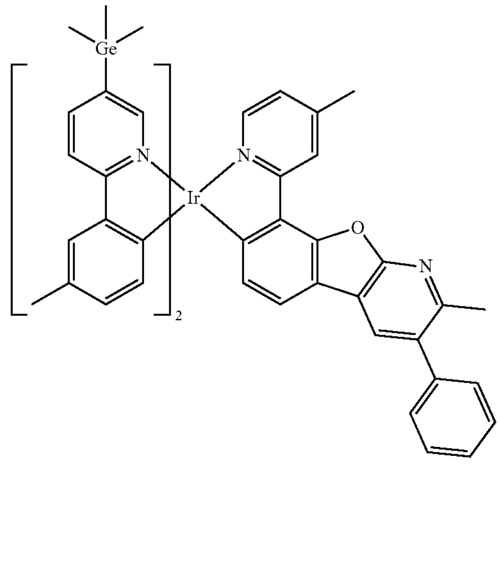
2243
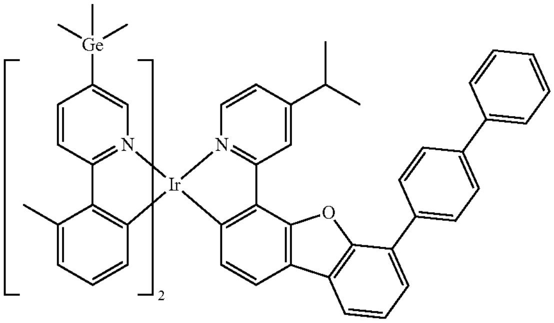
2244
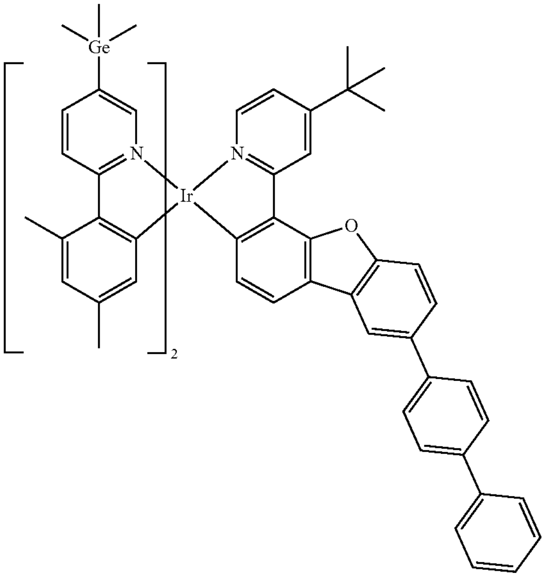
-continued
2245
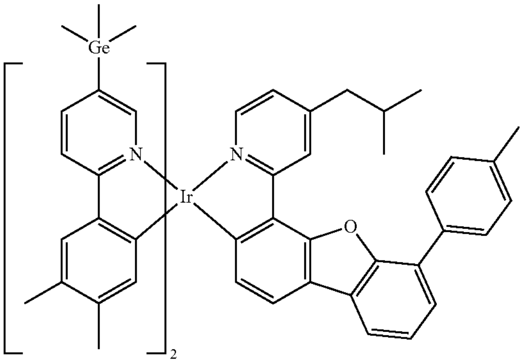
2246
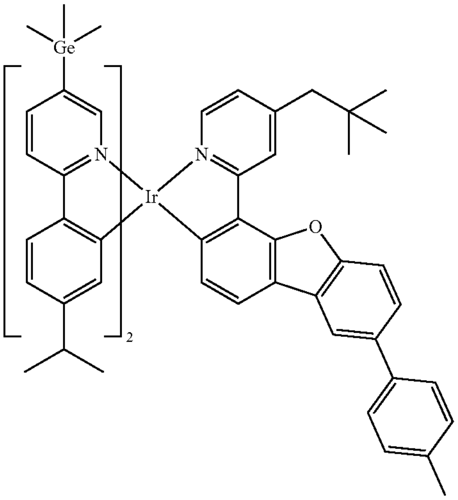
2247
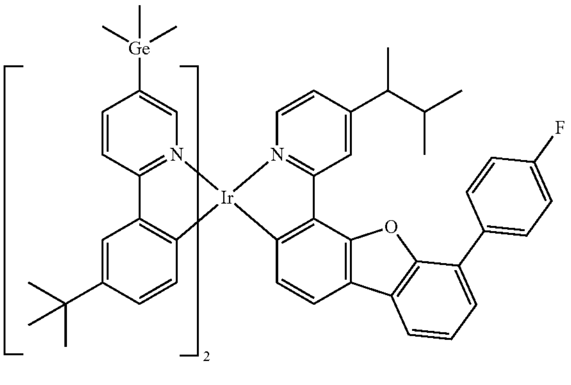

-continued
2248
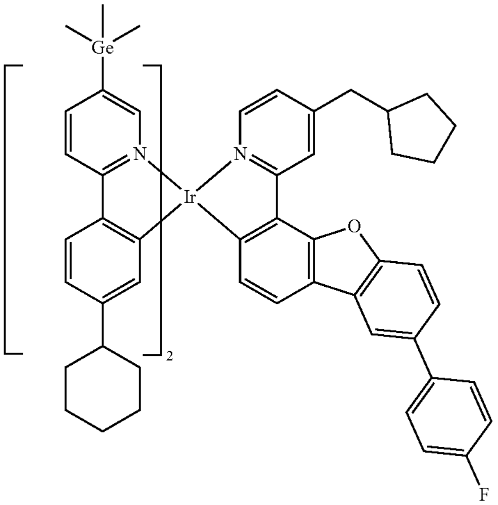
2249
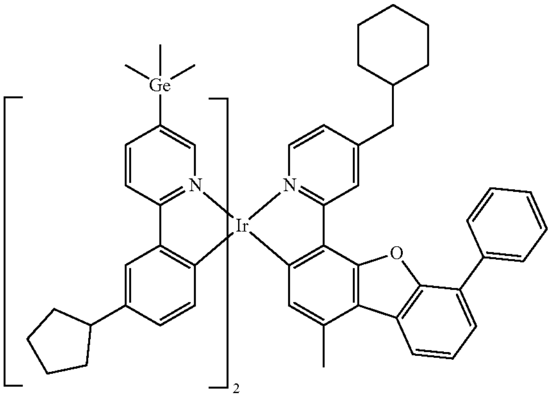
2250
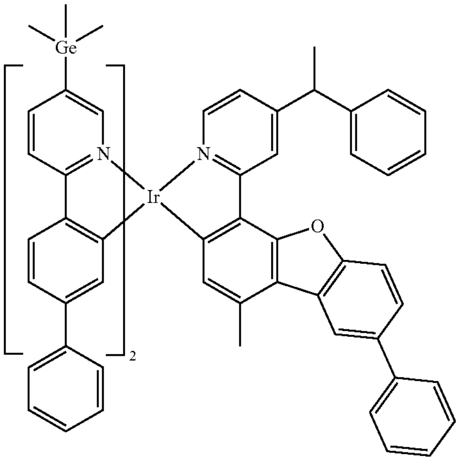
-continued
2251
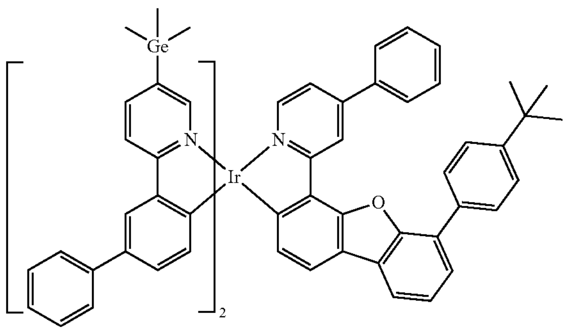
2252
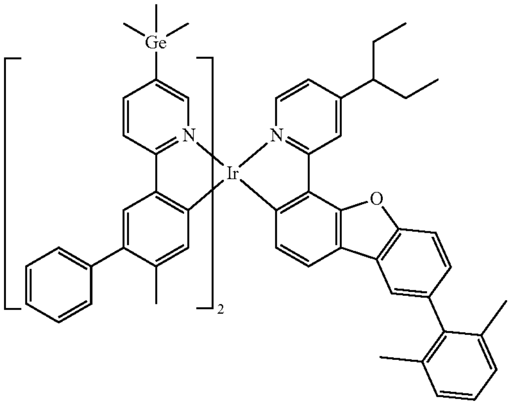
2253
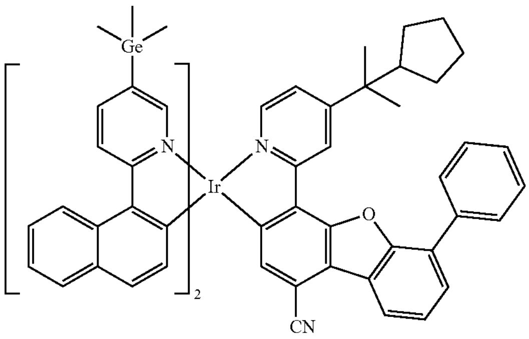
2254
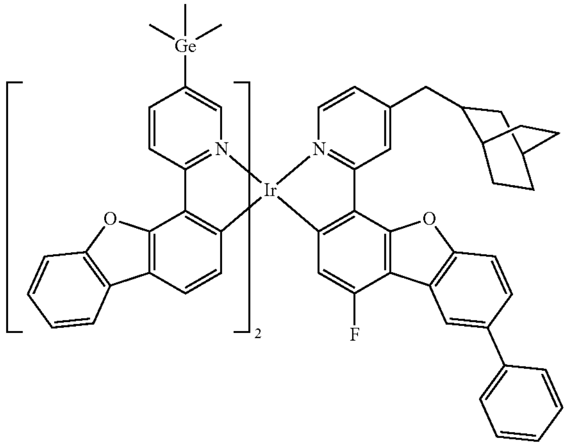

-continued
2255
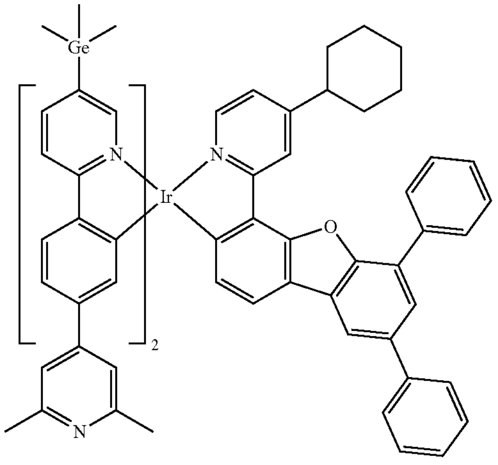
2256
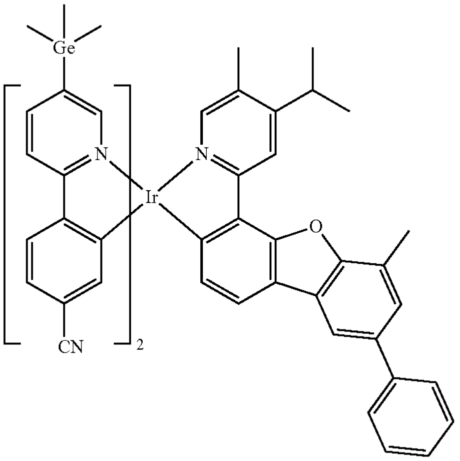
2257
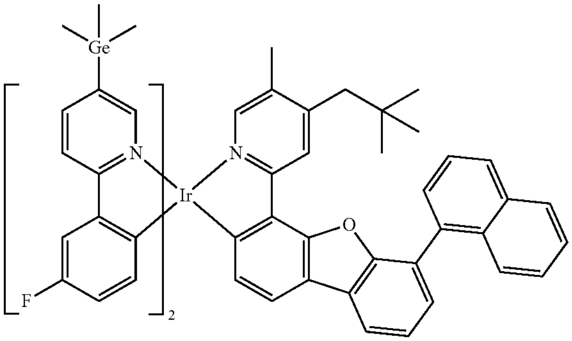
-continued
2258
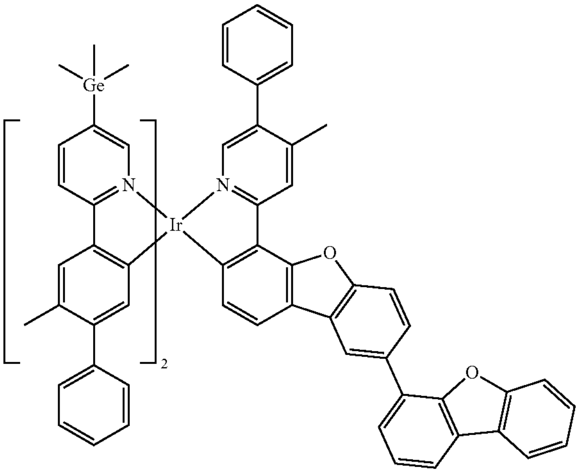
2259
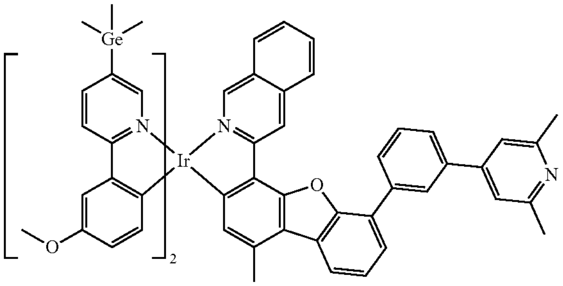
2260
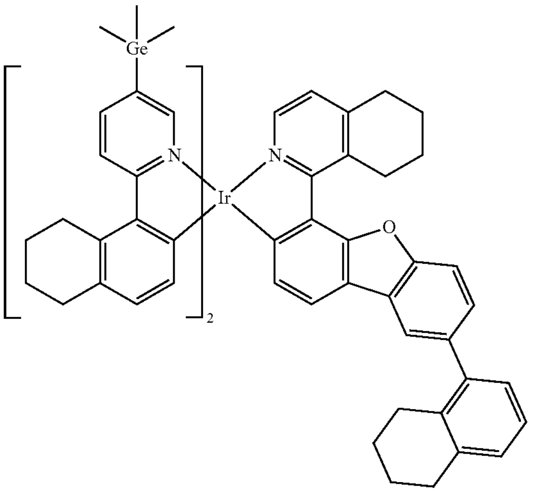

-continued
2261
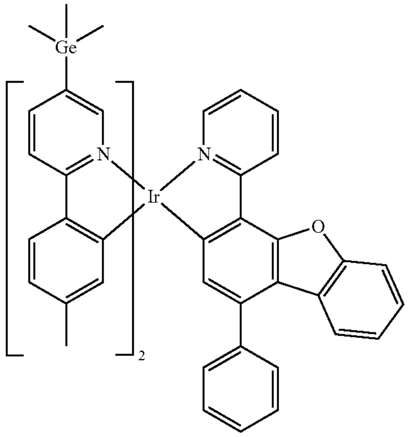
2262
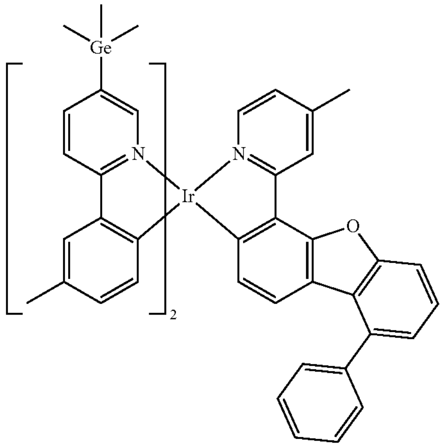
2263
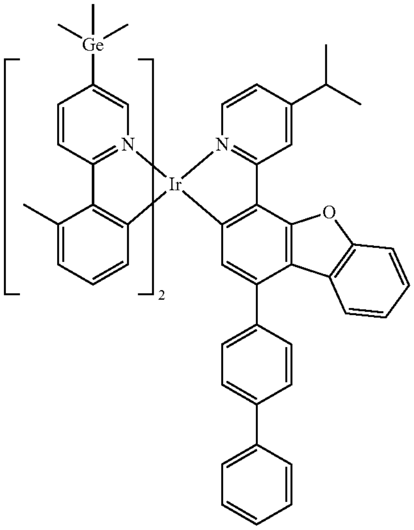
-continued
2264
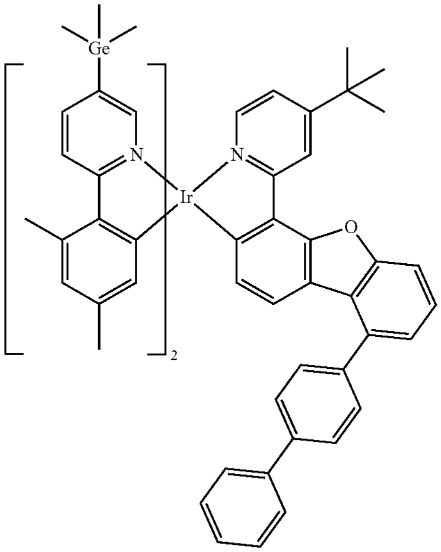
2265
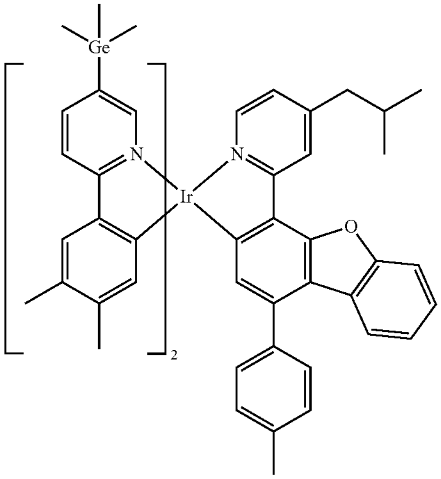
2266
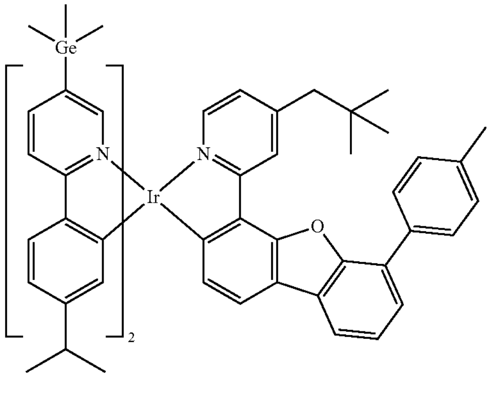

2267
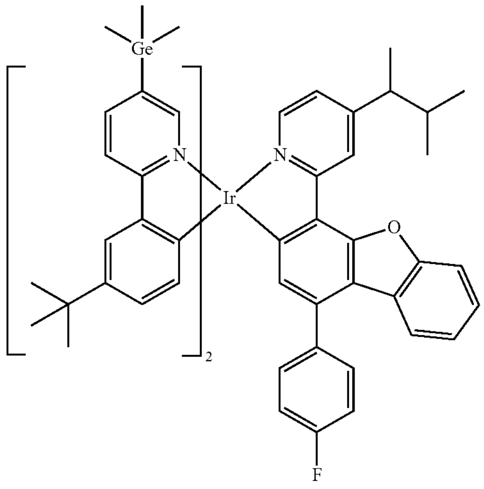
2270
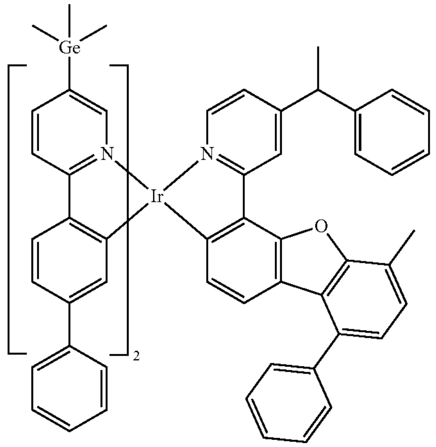
2268
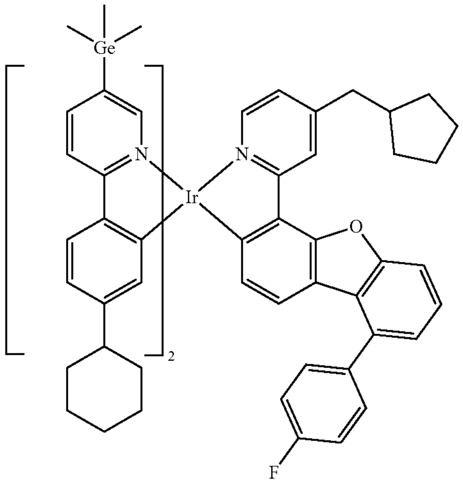
2271
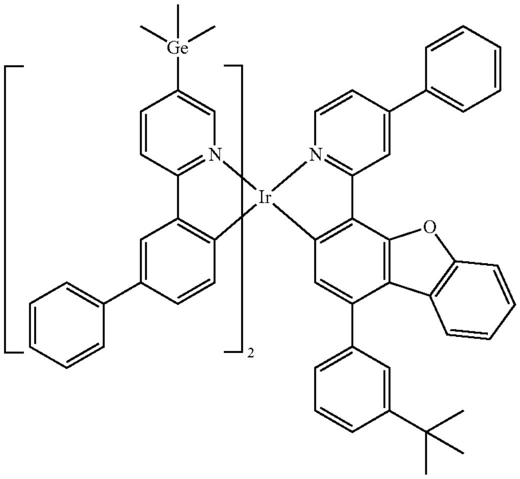
2269
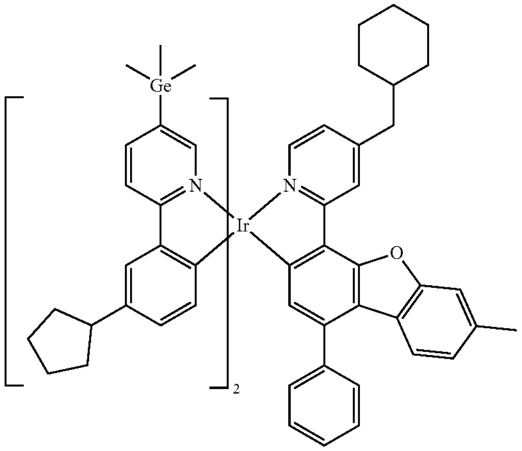
2272
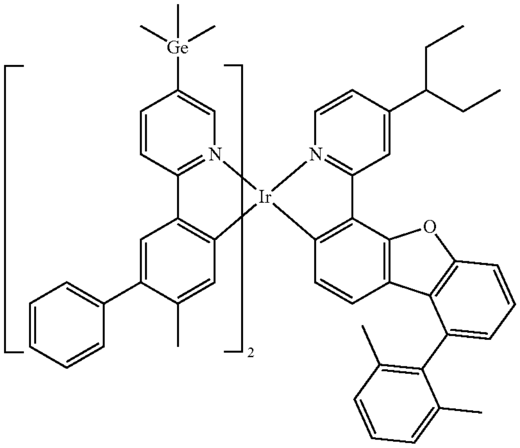

-continued
2273
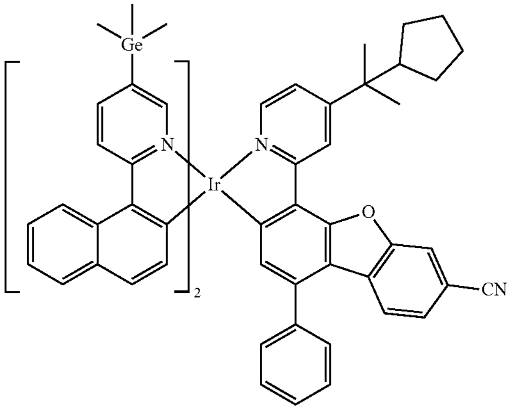
2274
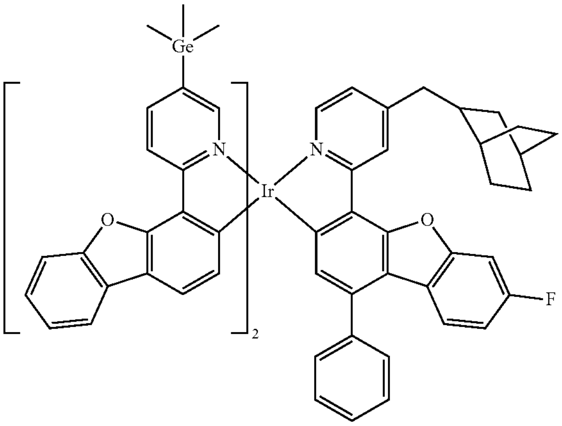
2275
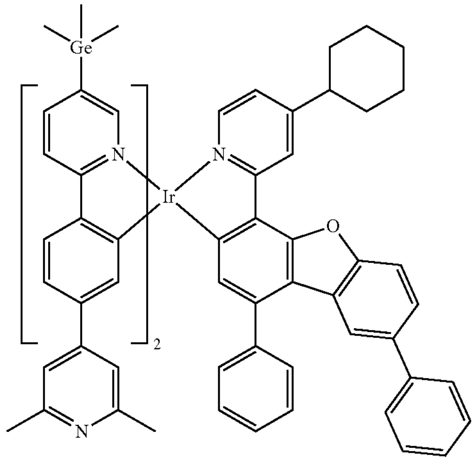
-continued
2276
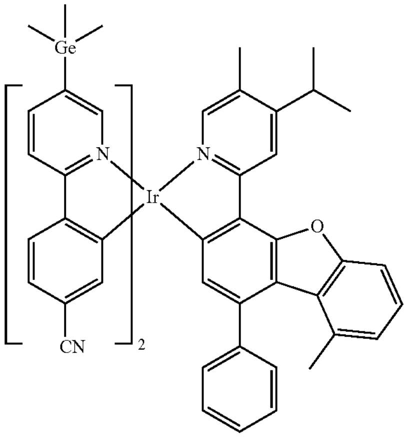
2277
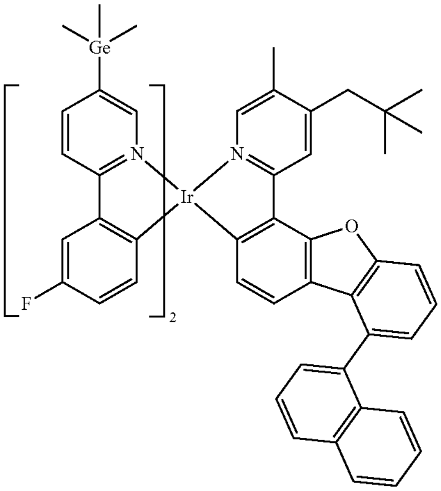
2278
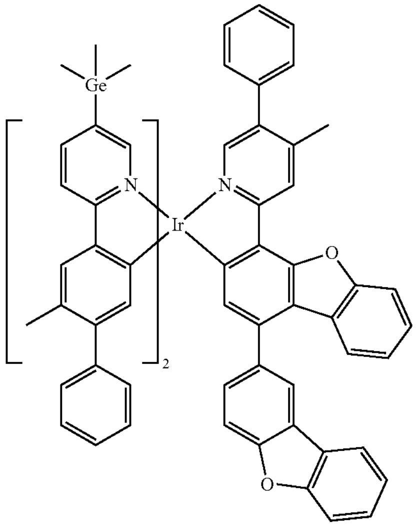

-continued
2279
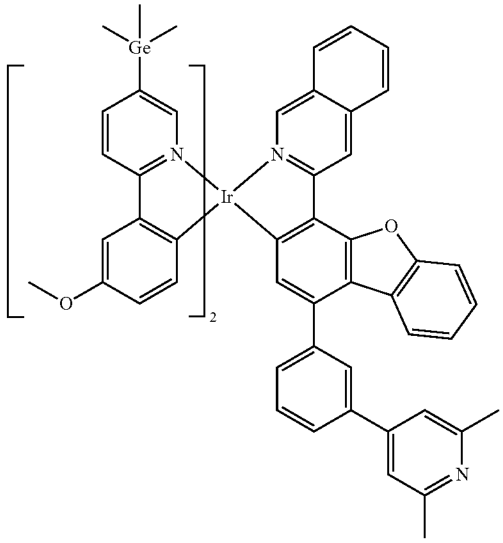
2280
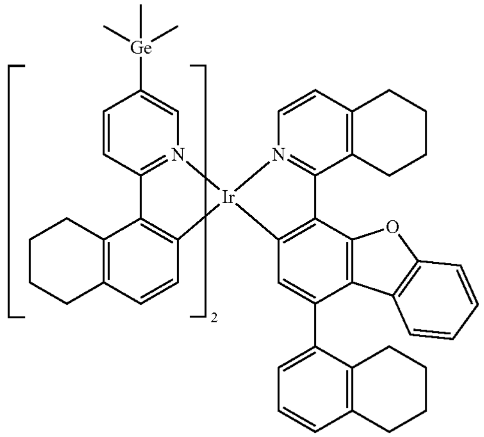
2281
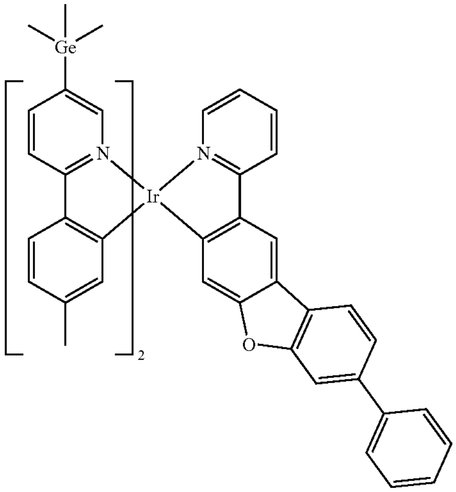
-continued
2282
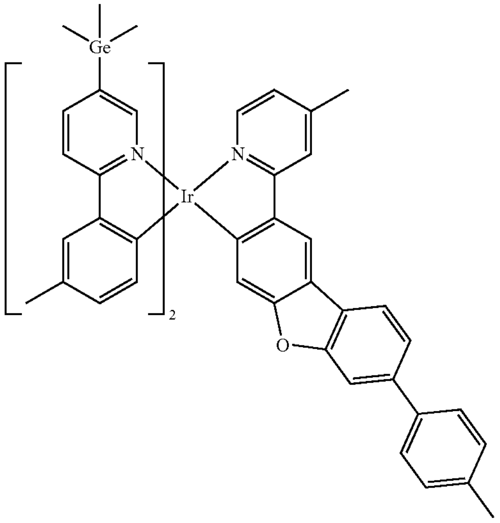
2283
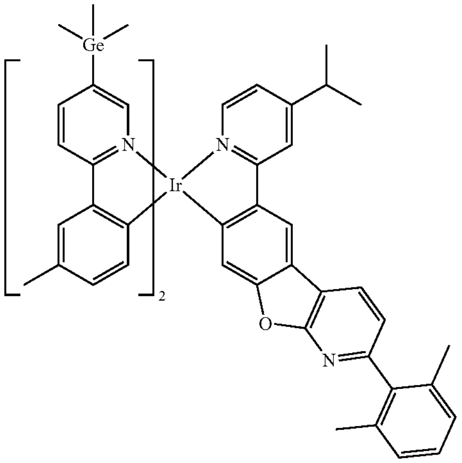
2284
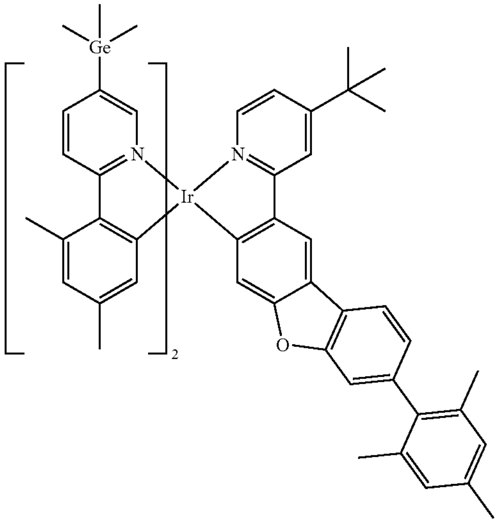

-continued
2285
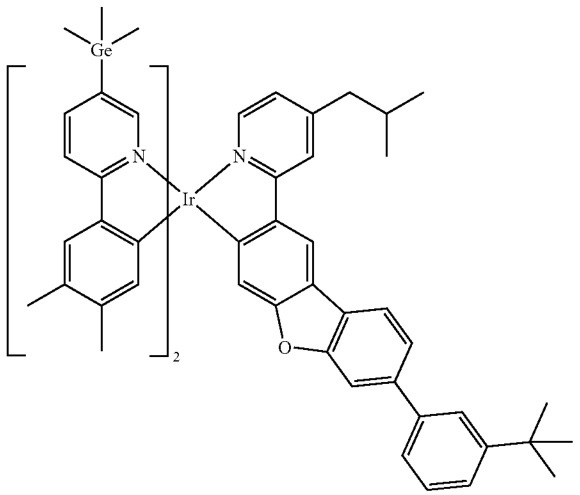
2286
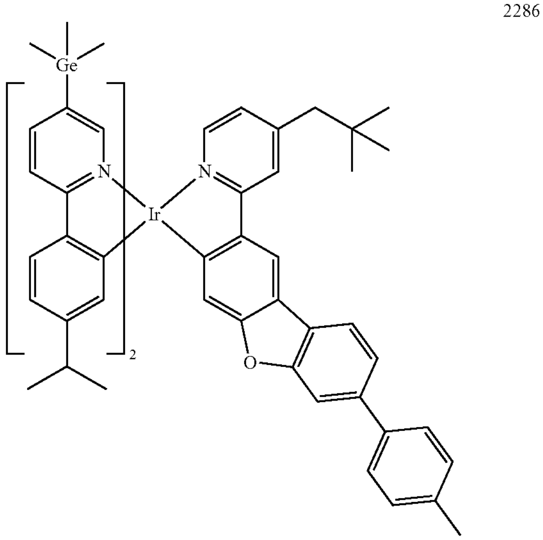
2287
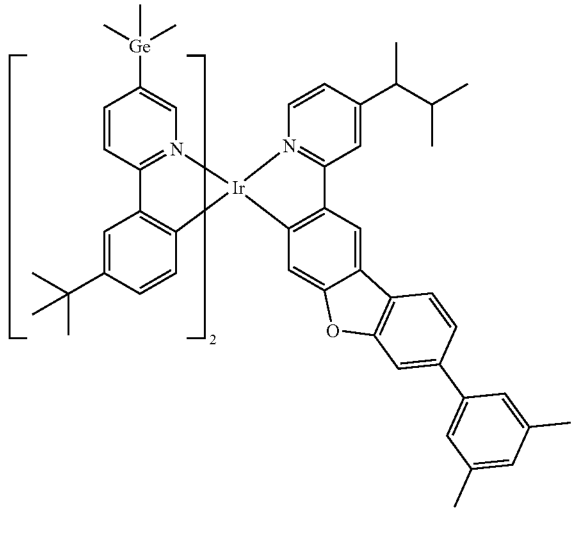
-continued
2288
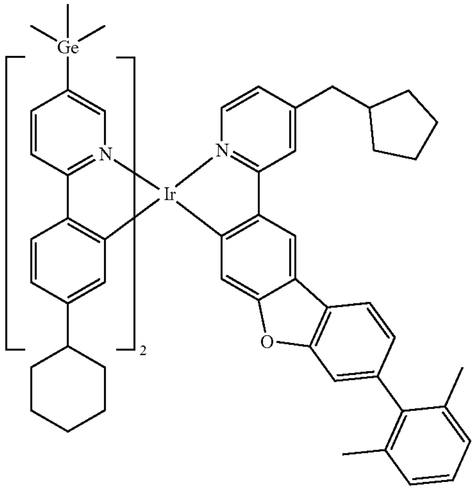
2289
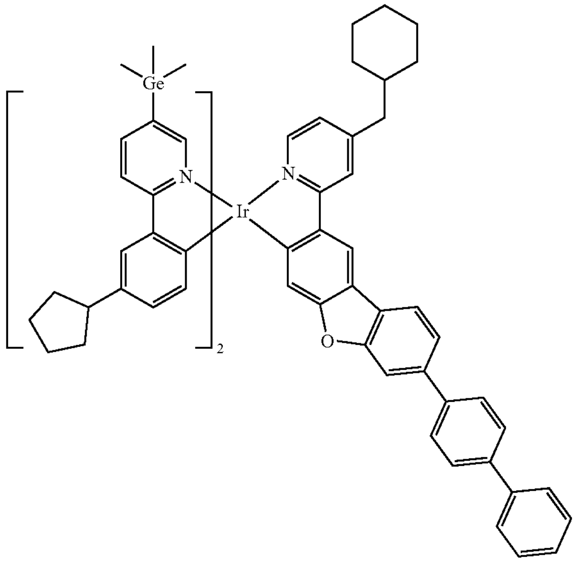
2290
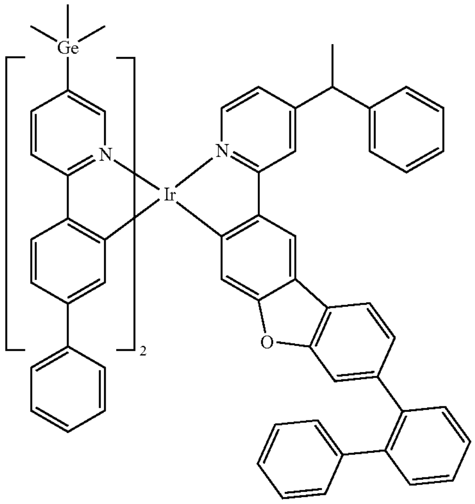

-continued
2291
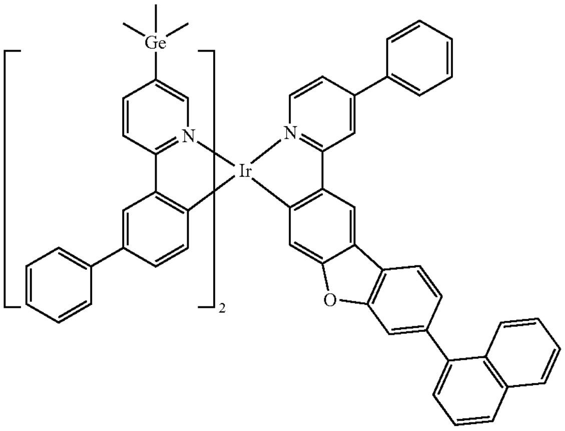
2292
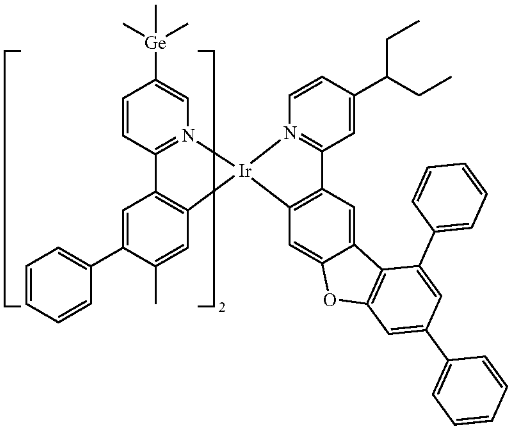
2293
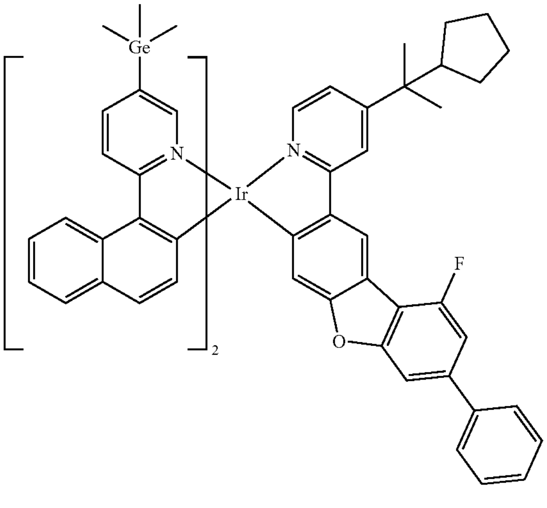
-continued
2294
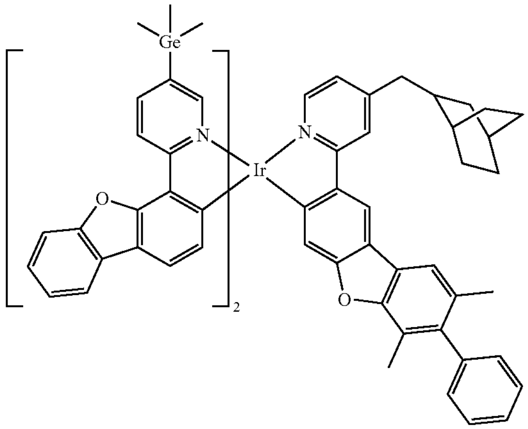
2295
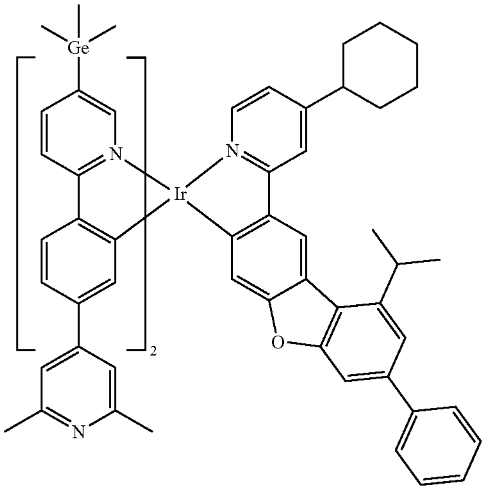
2296
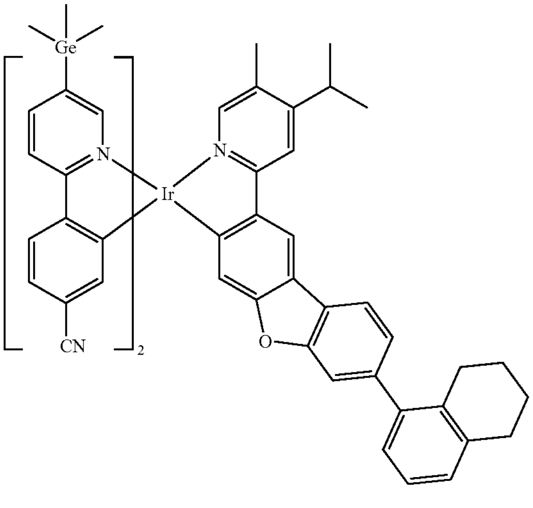

-continued
2297
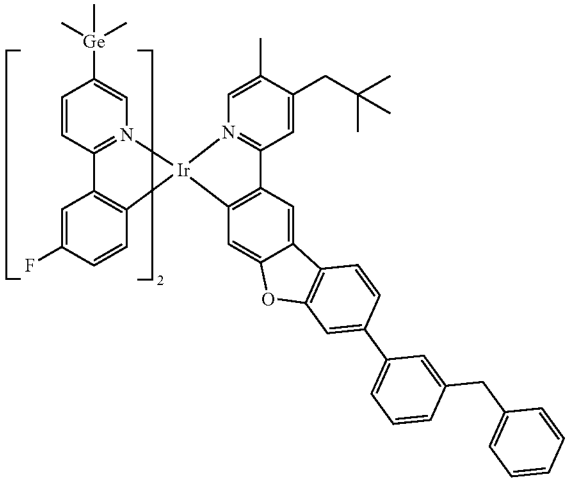
2298
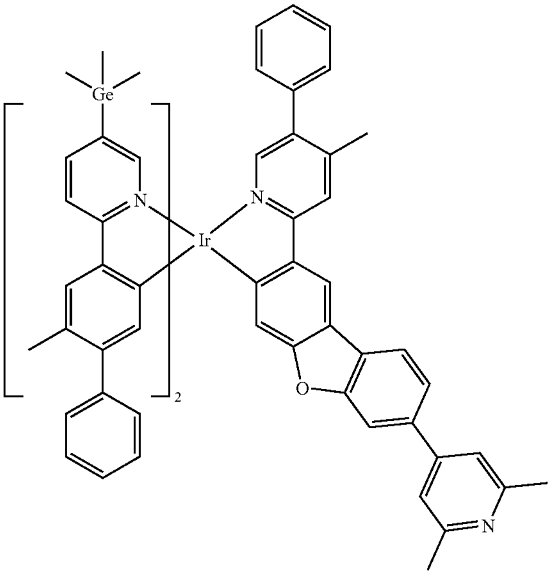
2299
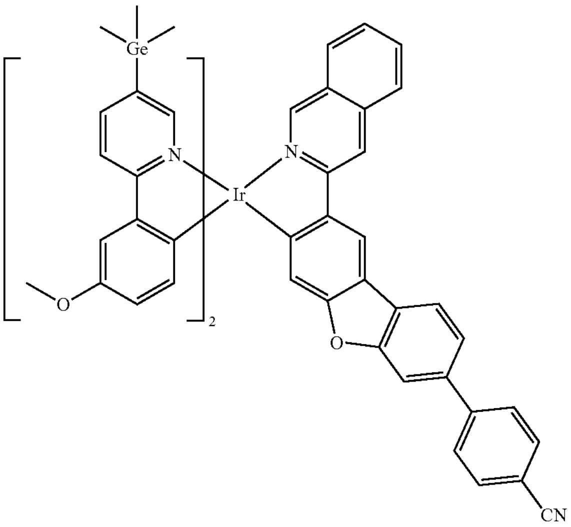
-continued
2300
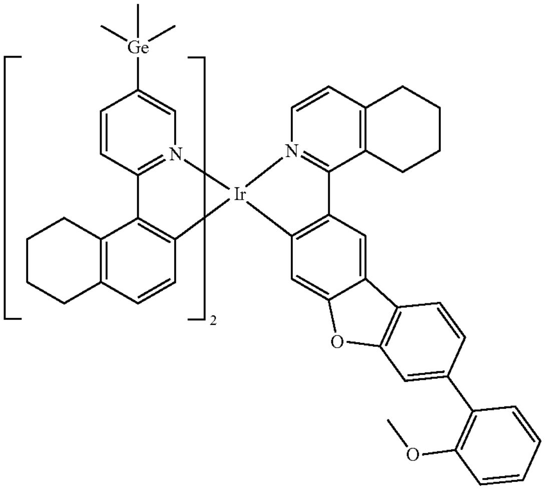
2301
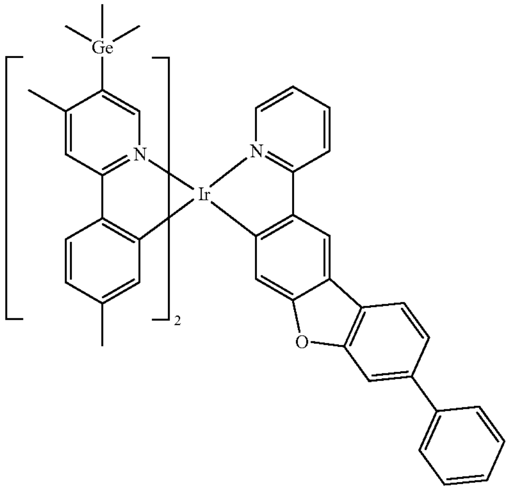
2302
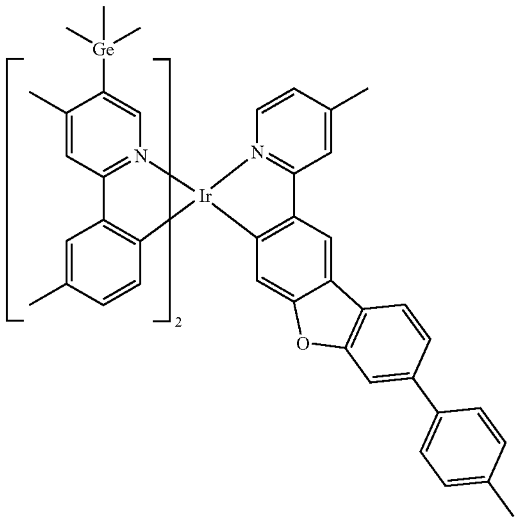

-continued
2303
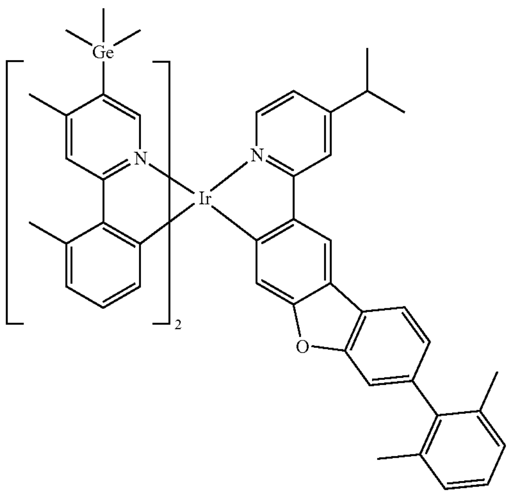
2304
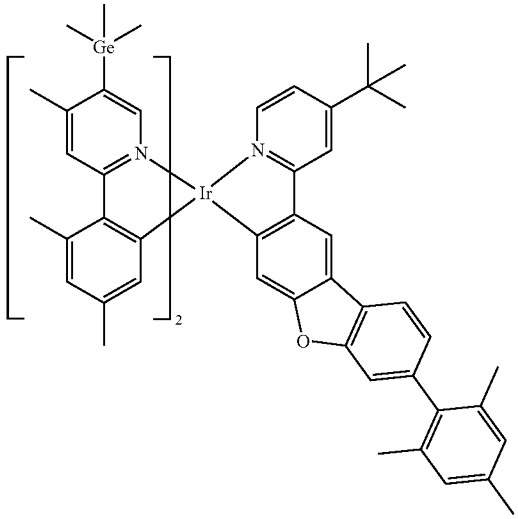
2305
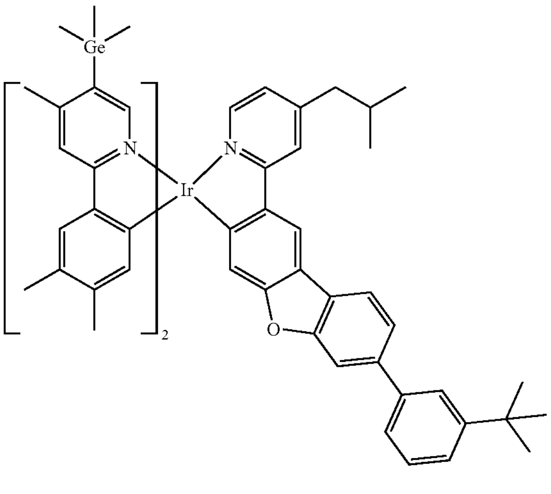
-continued
2306
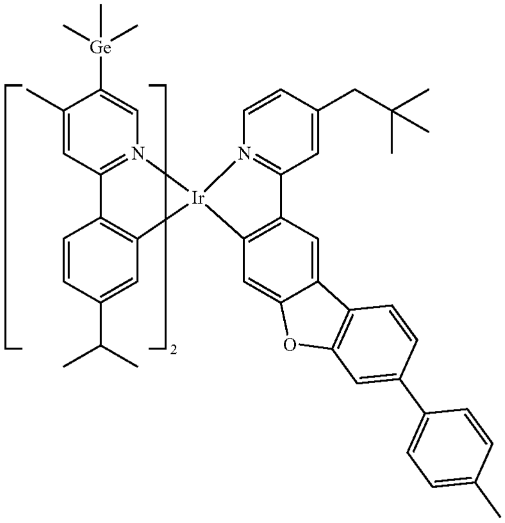
2307
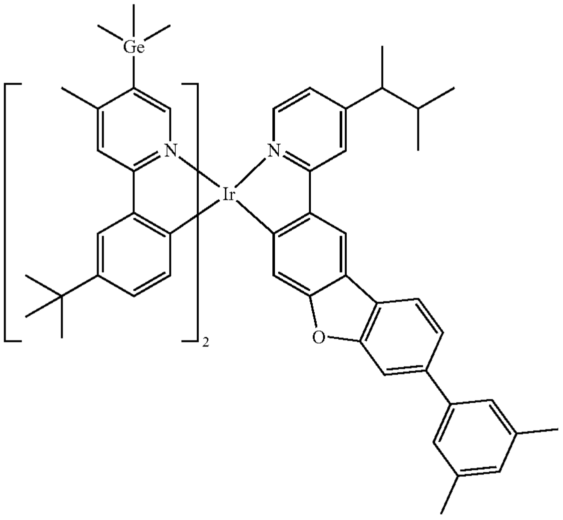
2308
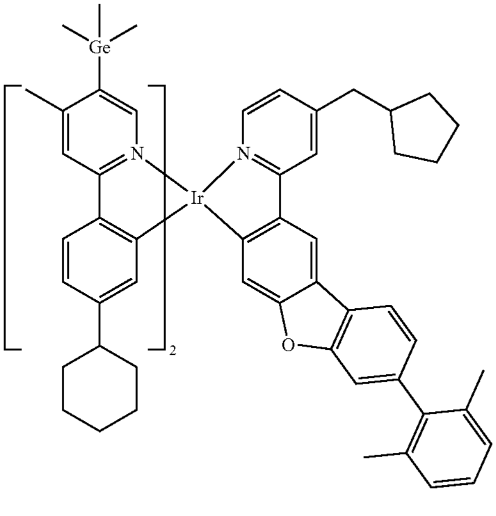

-continued
2309
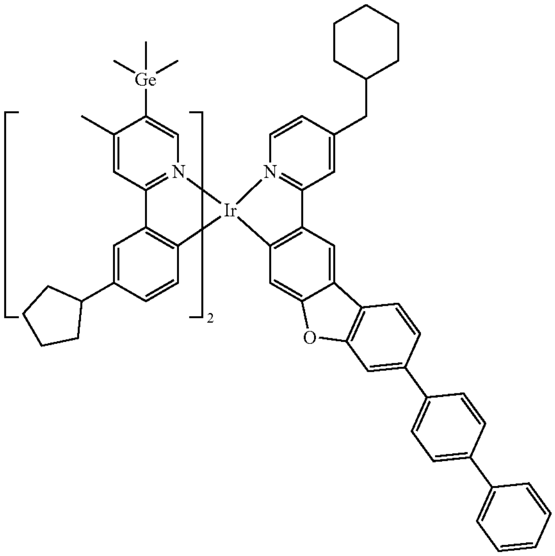
2310
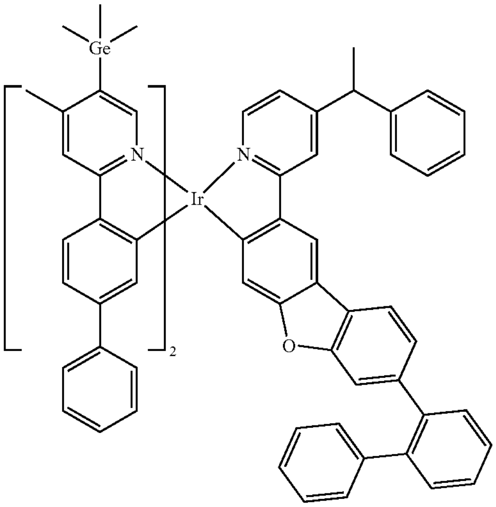
2311
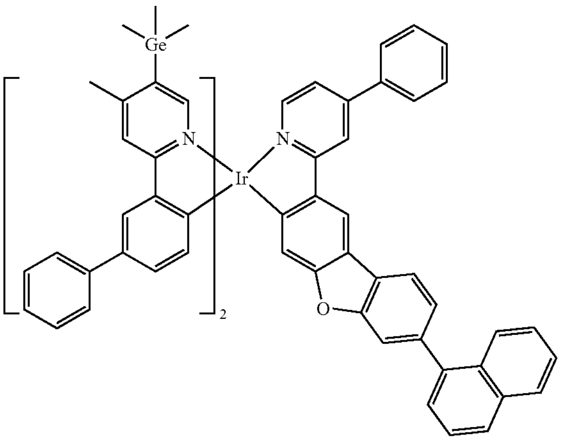
-continued
2312
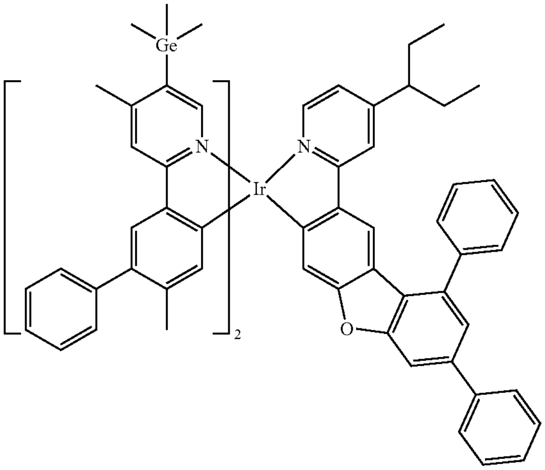
2313
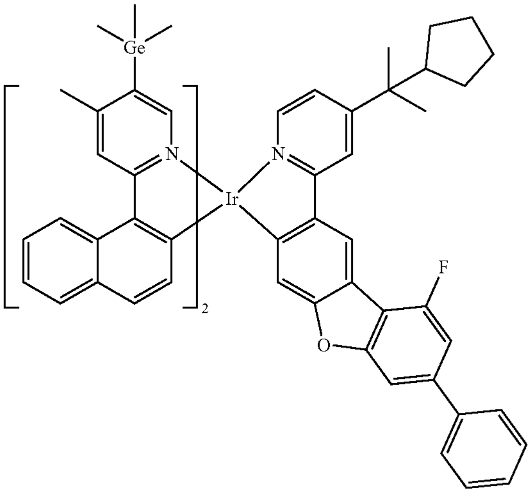
2314
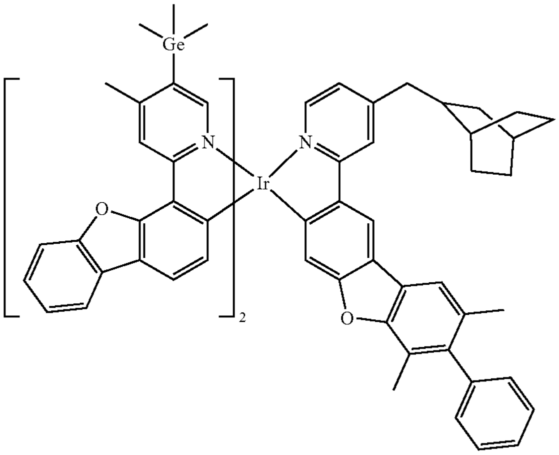

-continued
2315
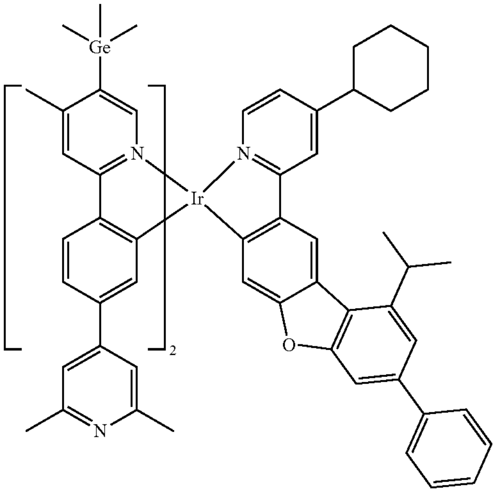
2316
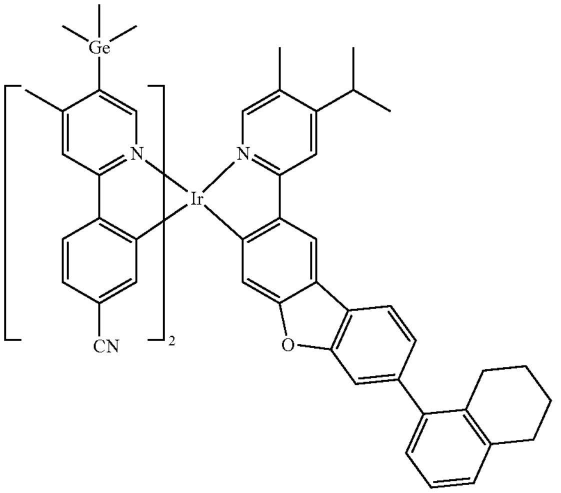
2317
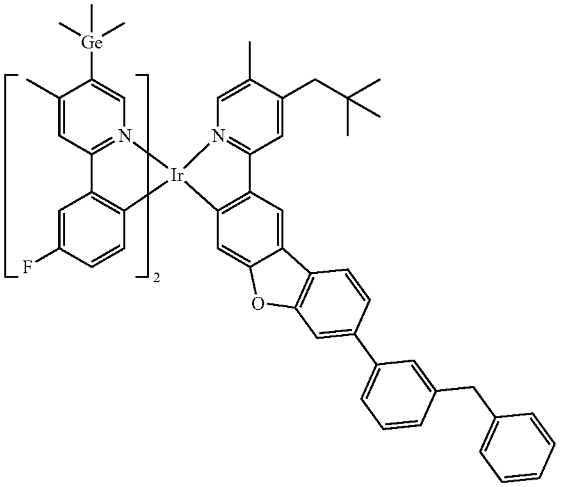
-continued
2318
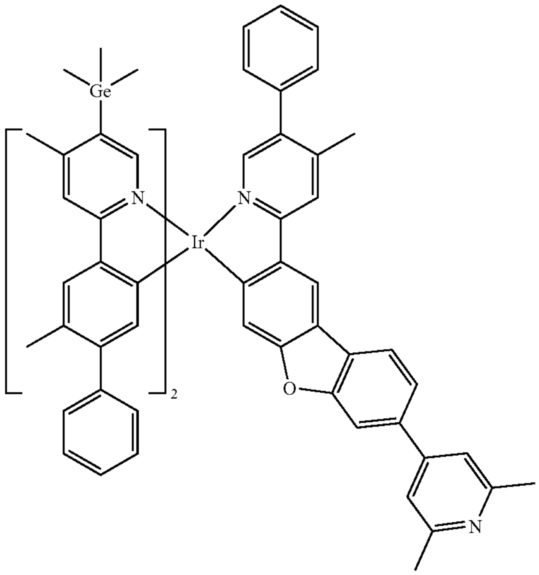
2319
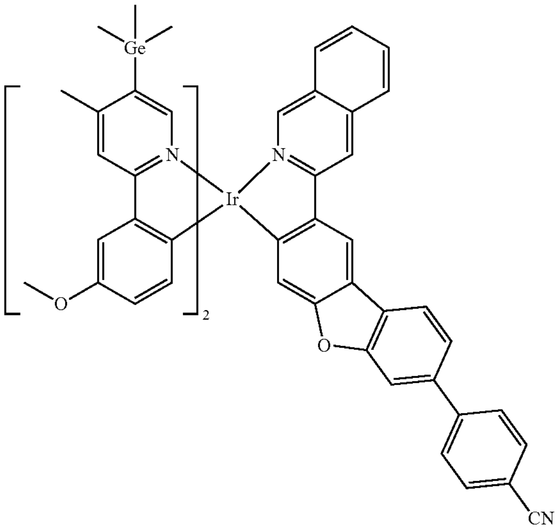
2320
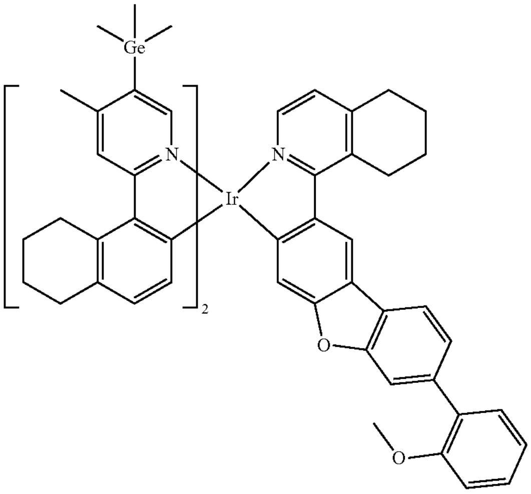

-continued
2321
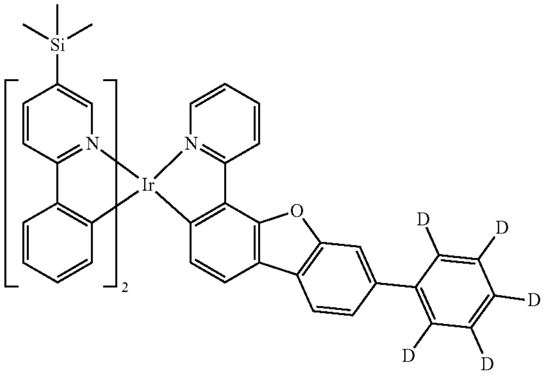
2322
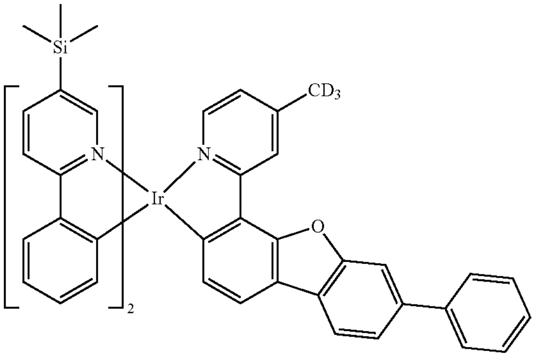
2323
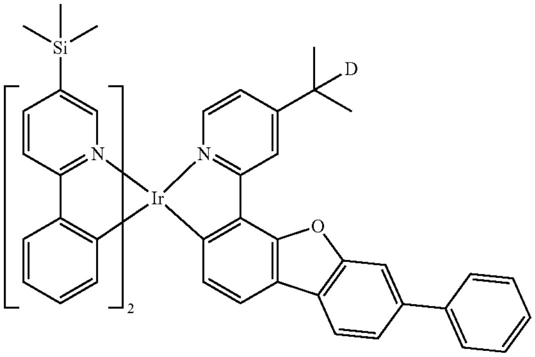
2324
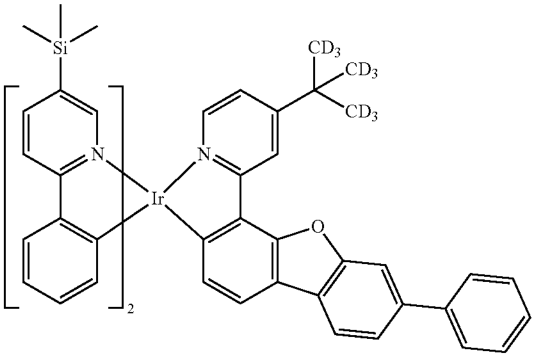
-continued
2325
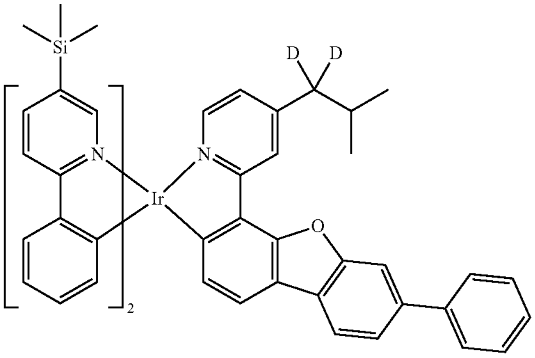
2326
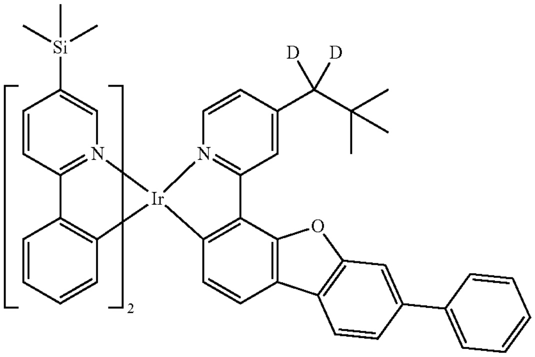
2327
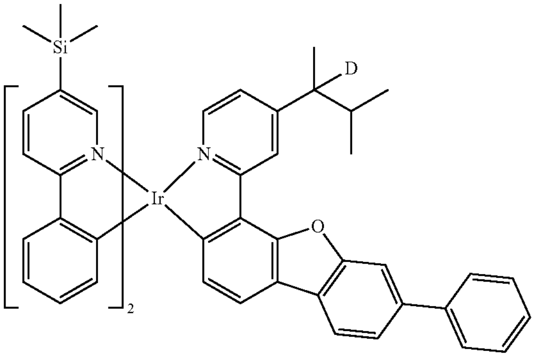
2328
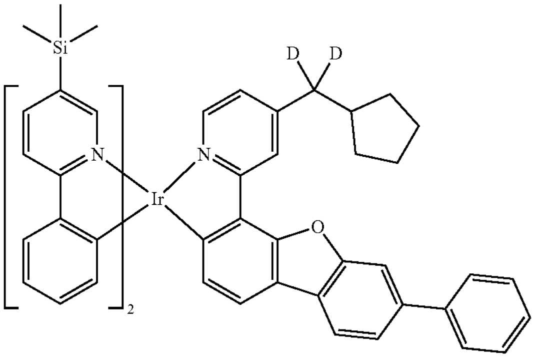

-continued
2329
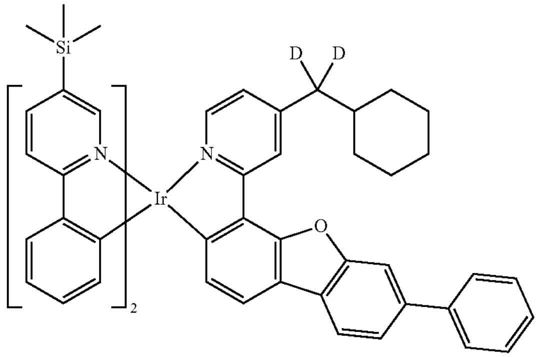
2330
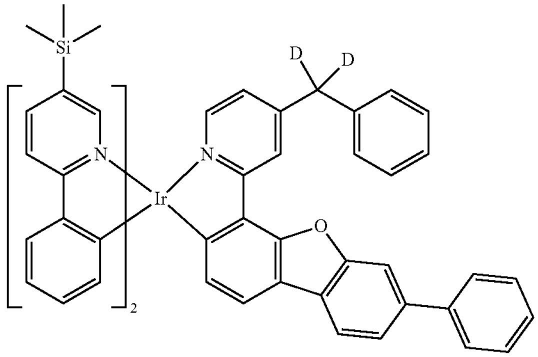
2331
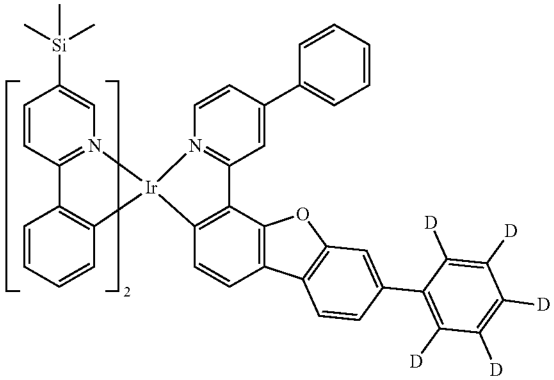
2332
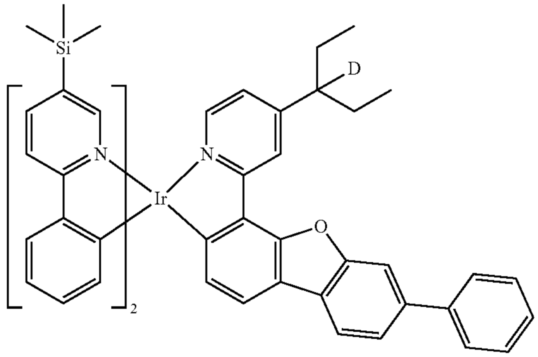
-continued
2333
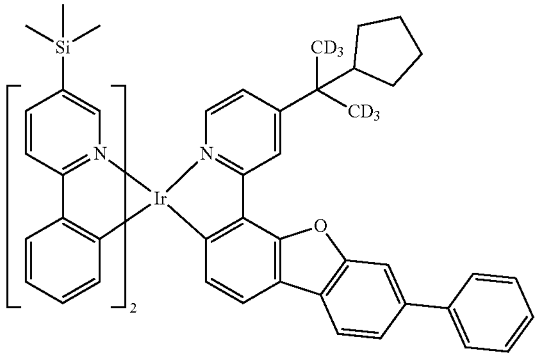
2334
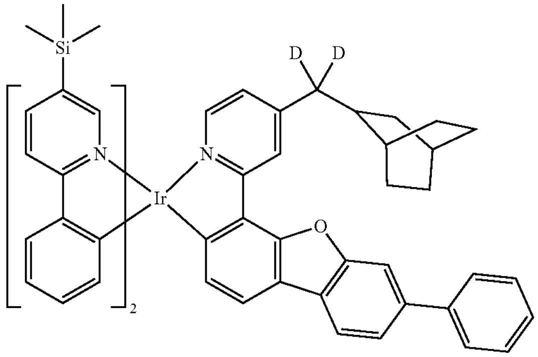
2335
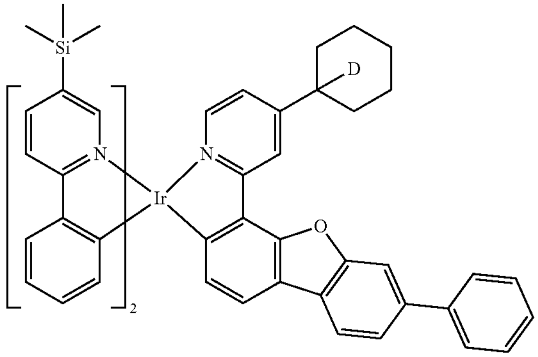
2336
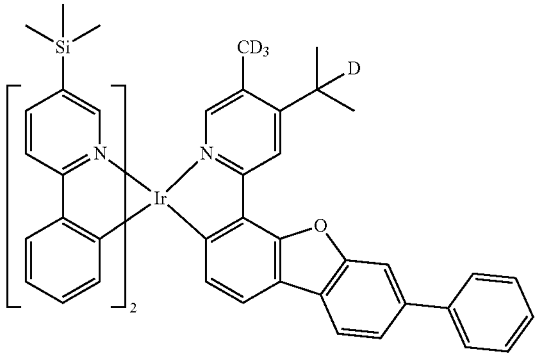

2337
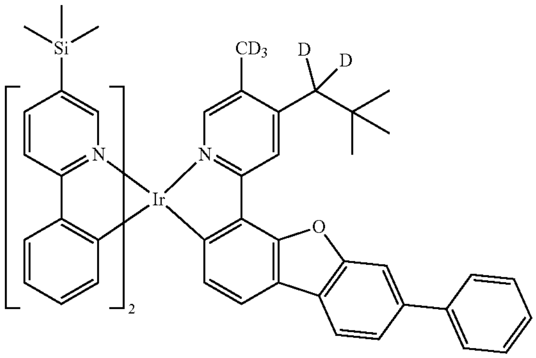
2338
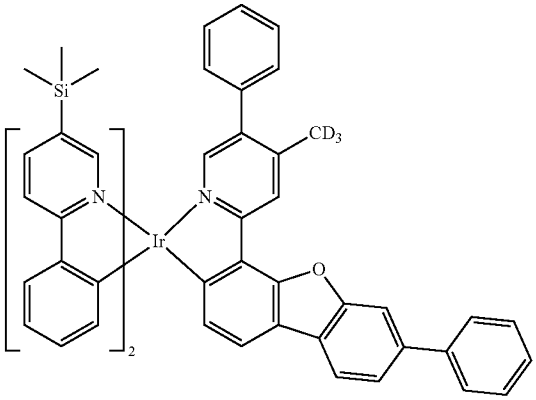
2339
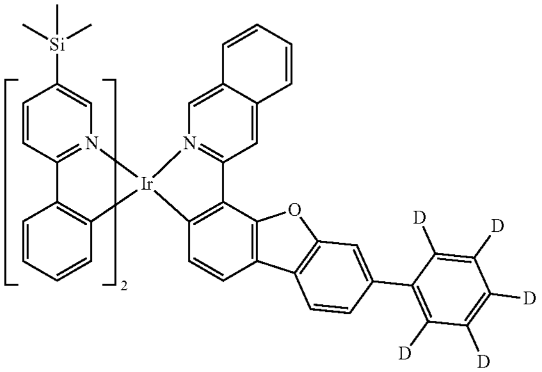
2340
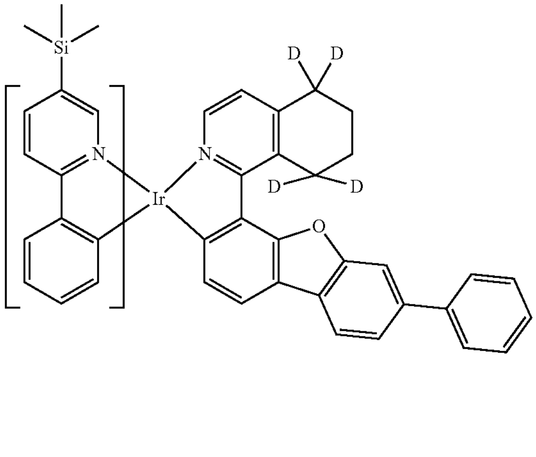
2341
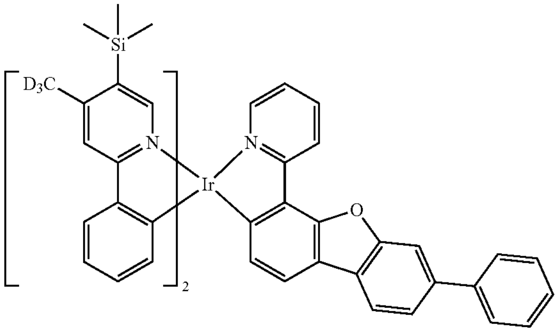
2342
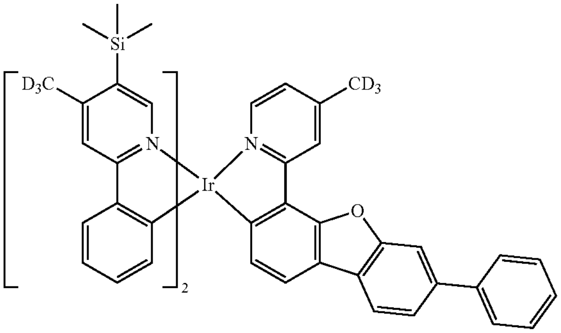
2343
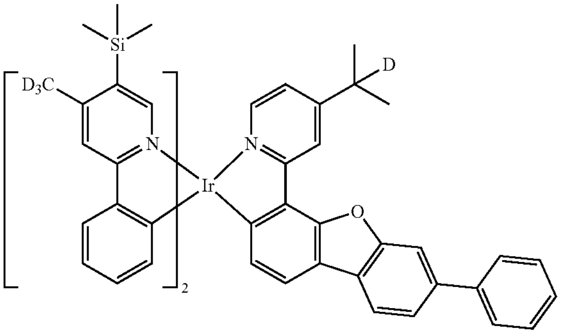
2344
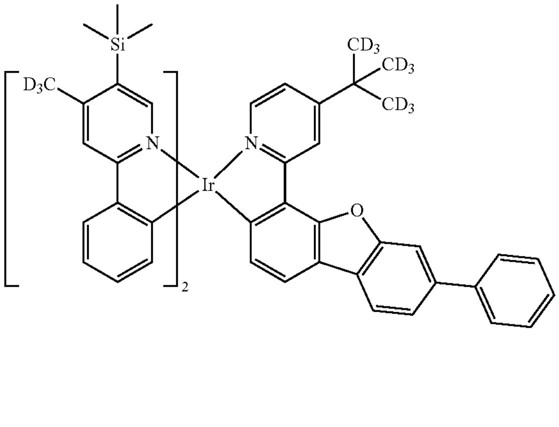

-continued
2345
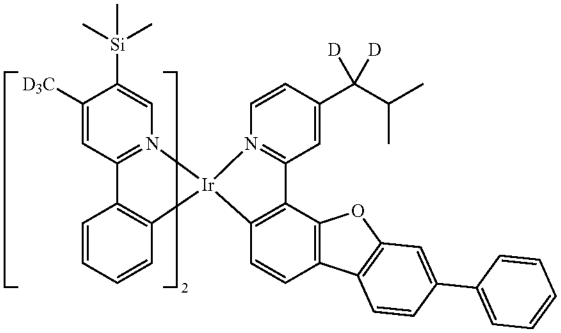
2346
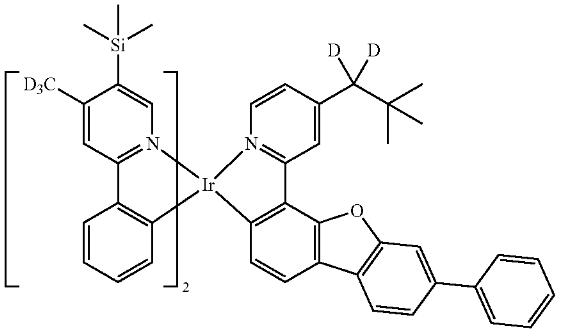
2347
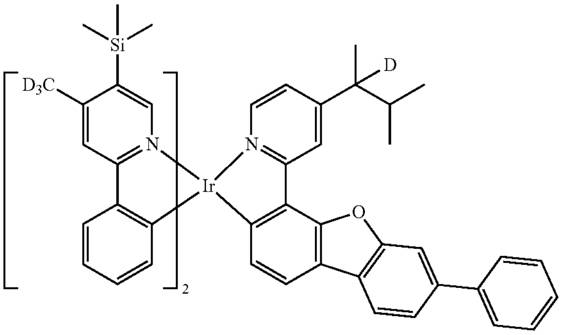
2348
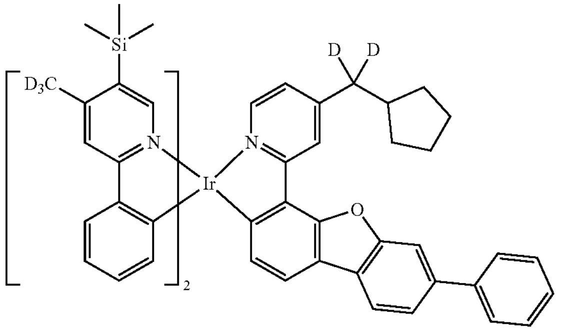
-continued
2349
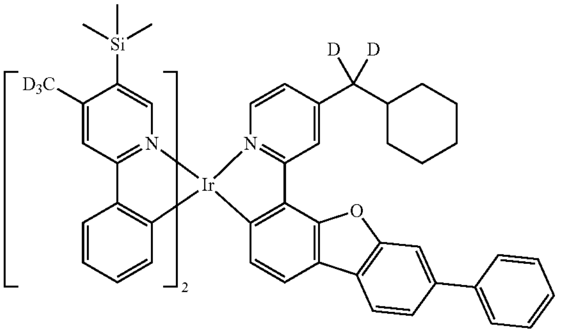
2350
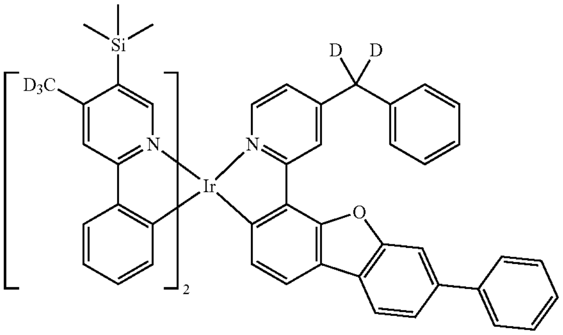
2351
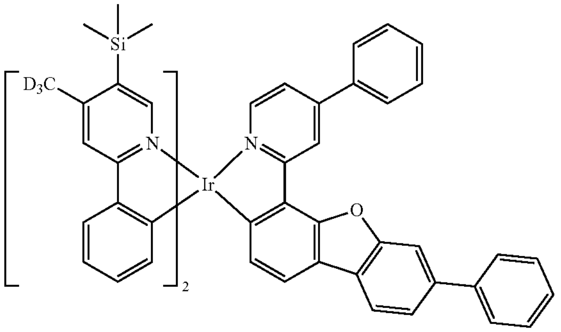
2352
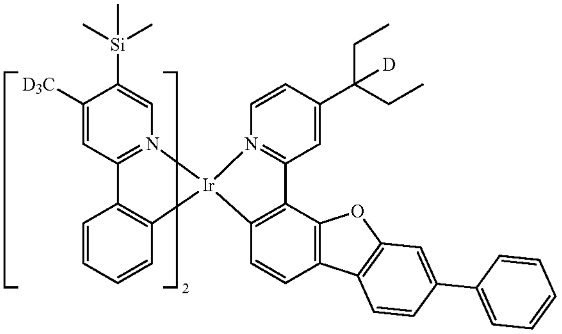

-continued
2353
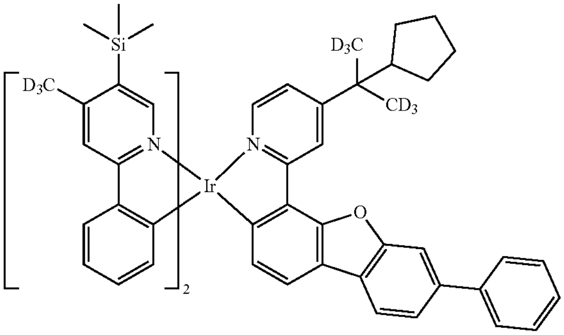
2354
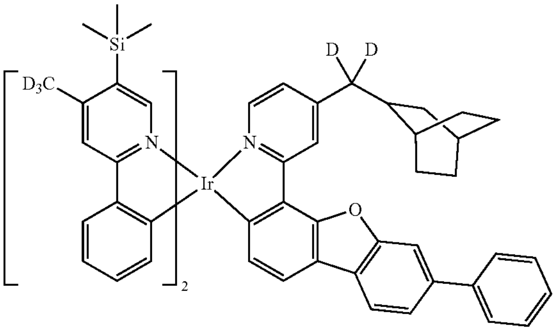
2355
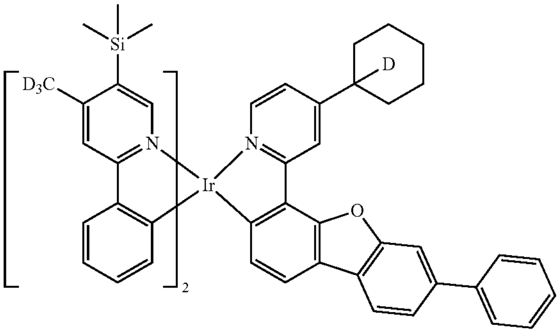
2356
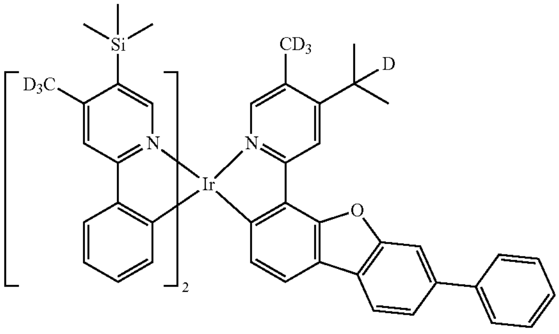
-continued
2357
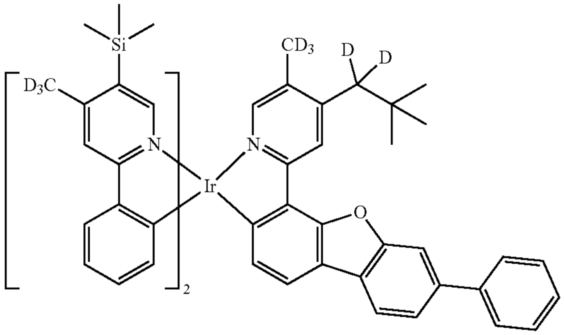
2358
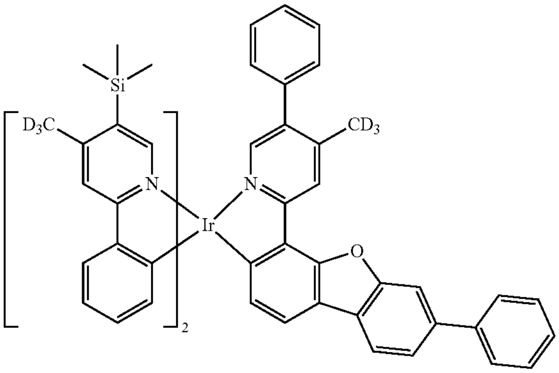
2359
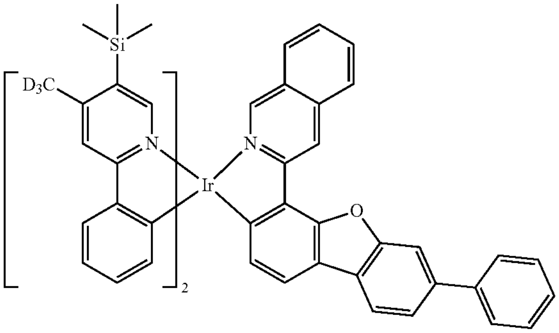
2360
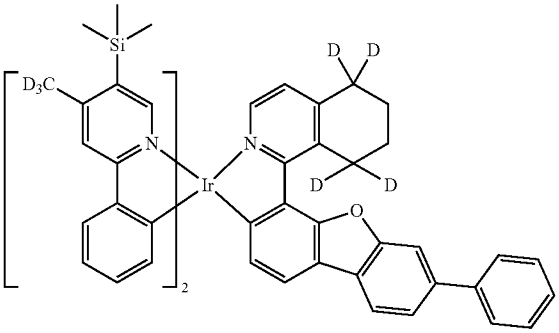

-continued
2361
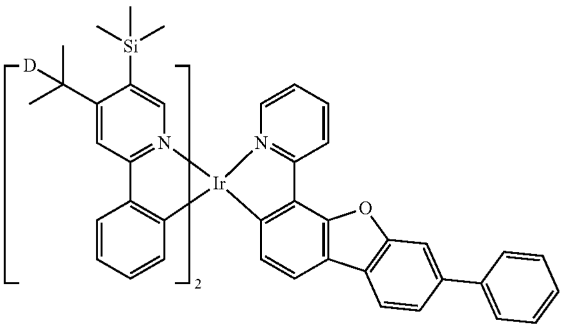
2362
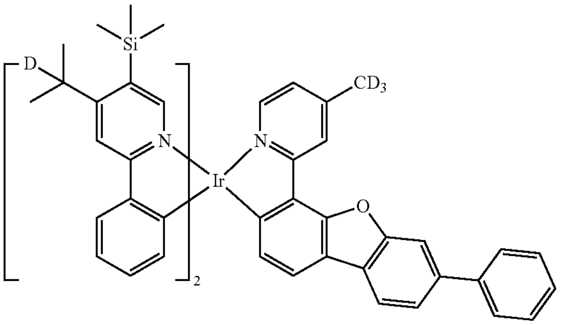
2363
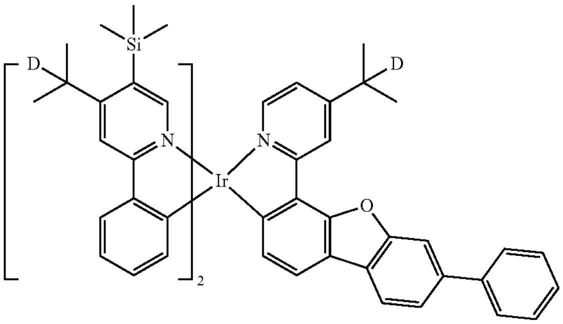
2364
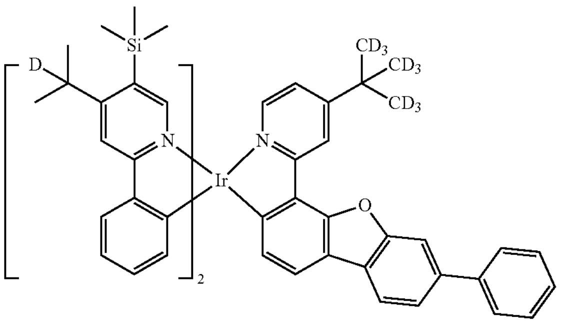
-continued
2365
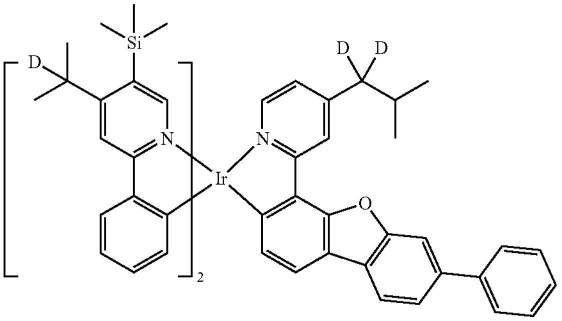
2366
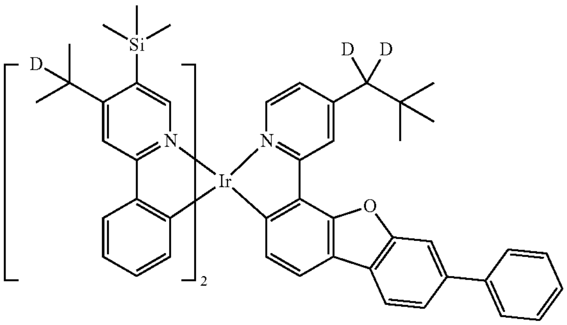
2367
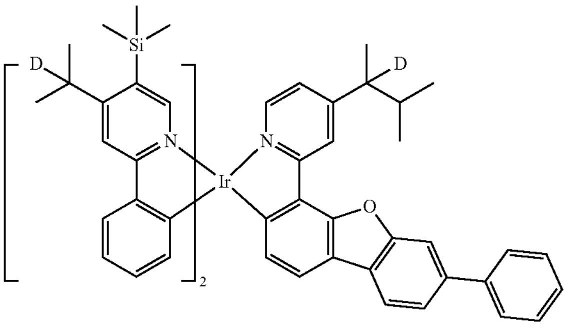
2368
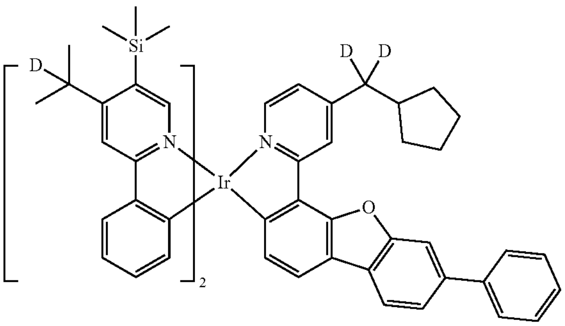

-continued
2369
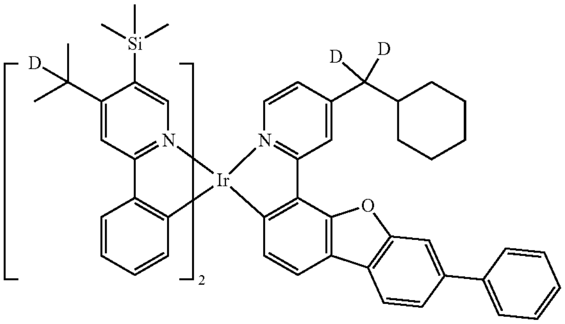
2370
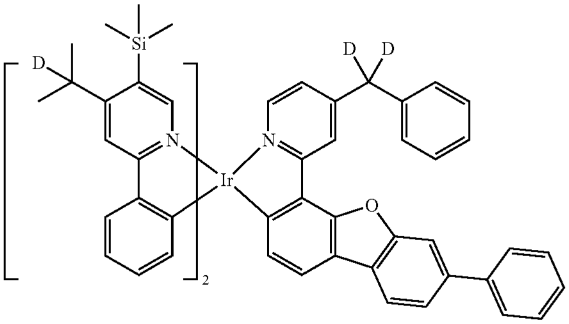
2371
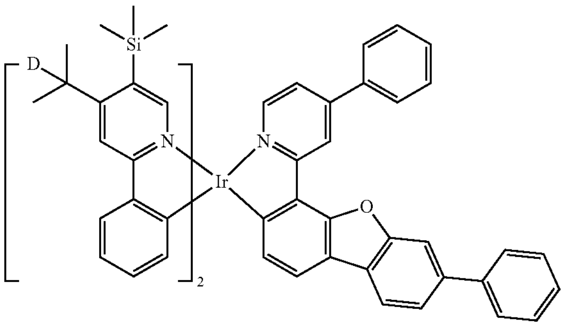
2372
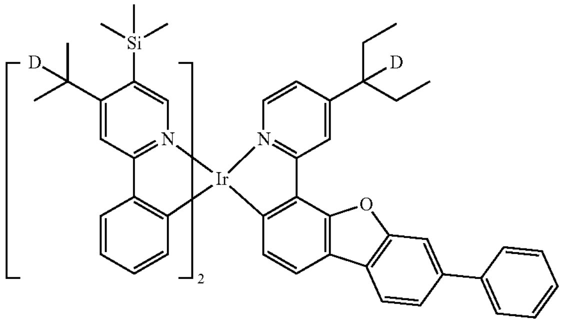
-continued
2373
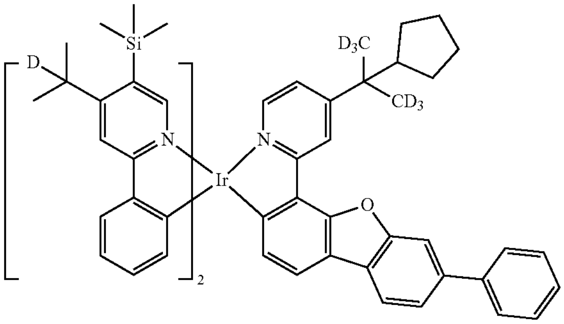
2374
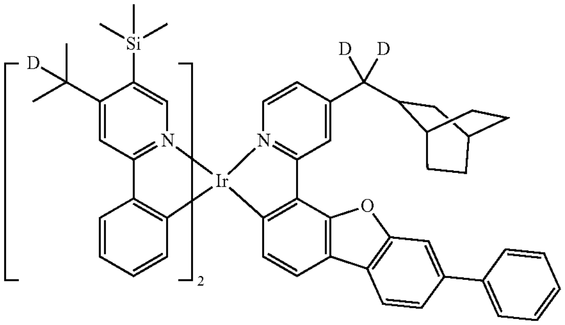
2375
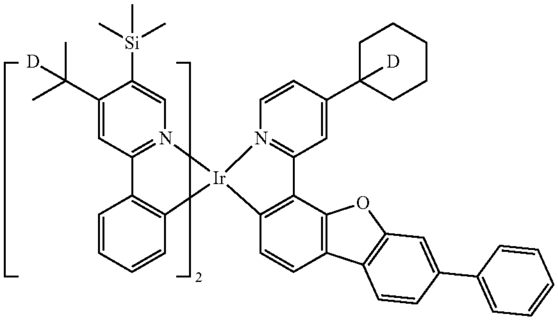
2376
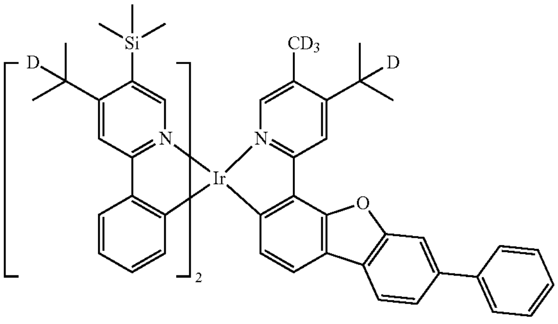

-continued
2377
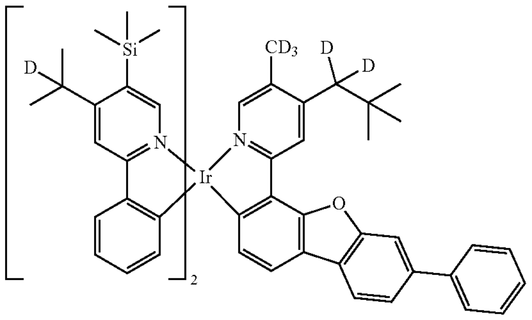
2378
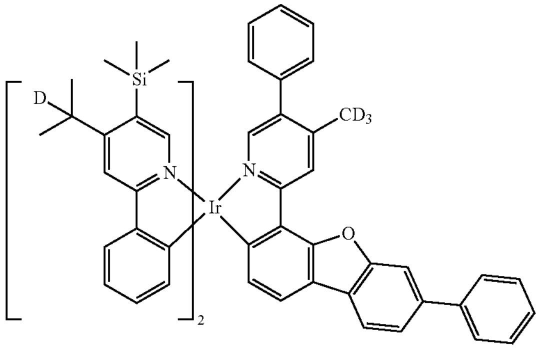
2379
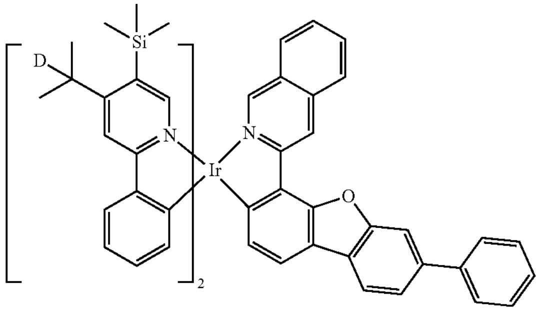
2380
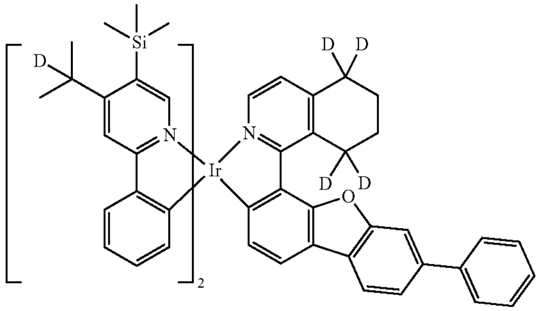
2381
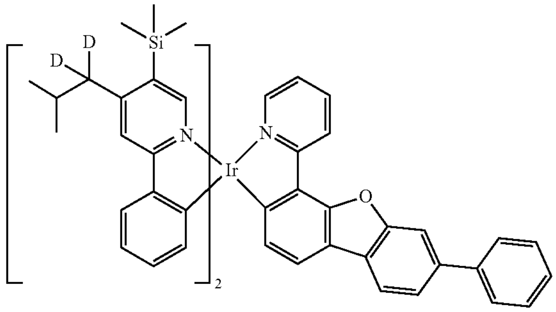
2382
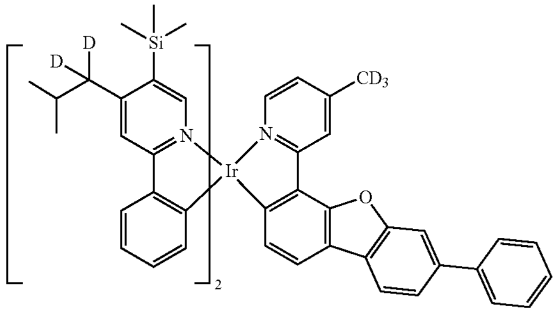
2383
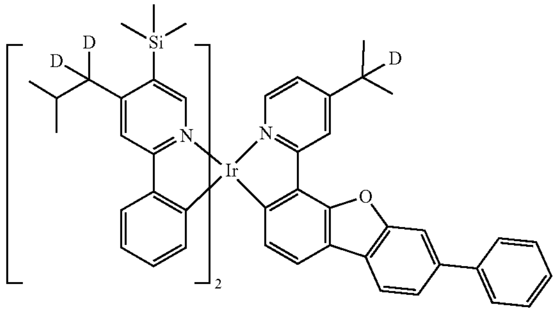
2384
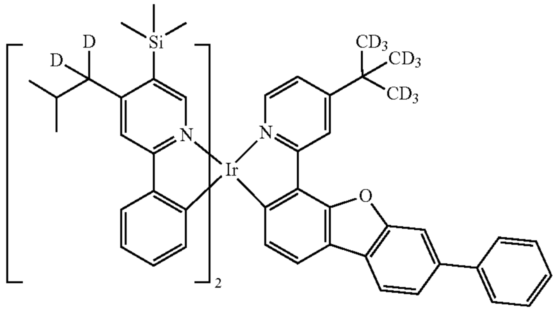

-continued
2385
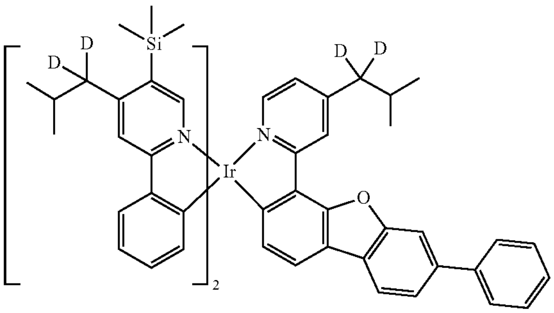
2386
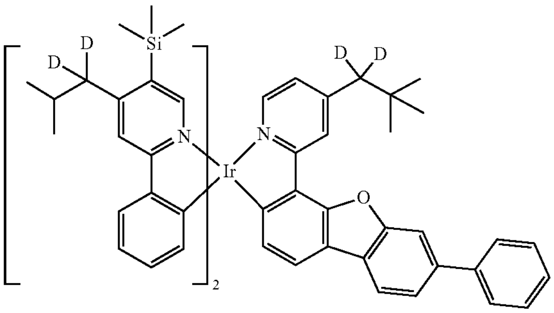
2387
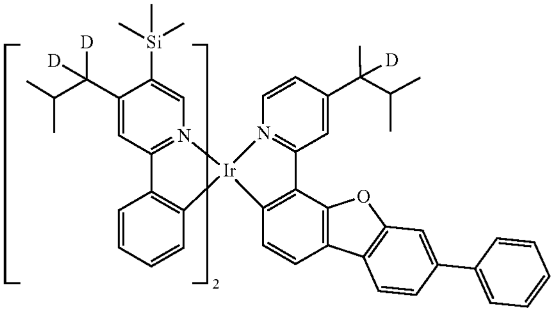
2388
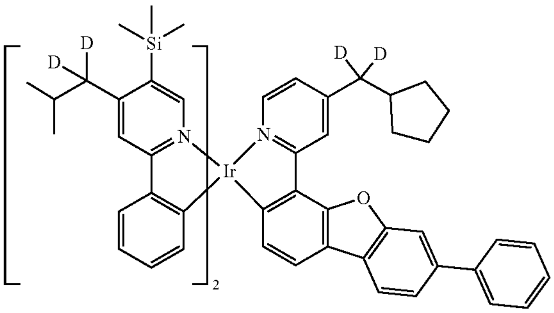
-continued
2389
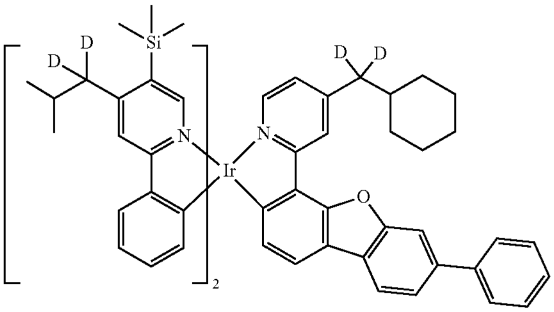
2390
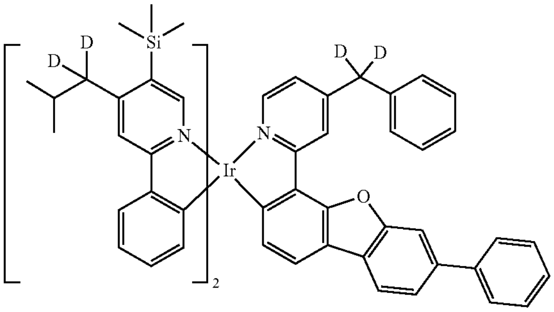
2391
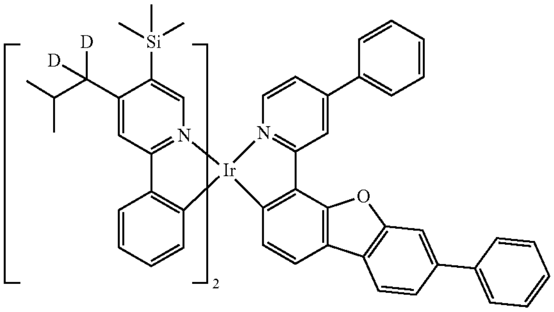
2392
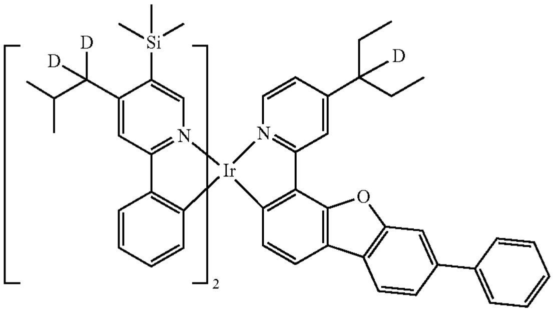

-continued
2393
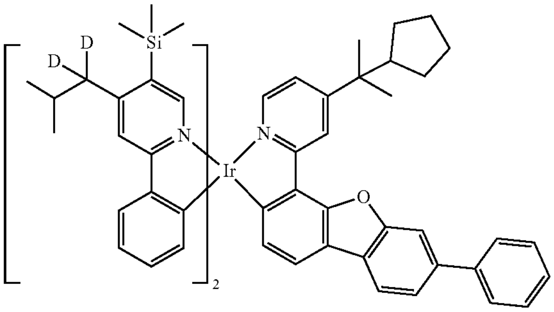
2394
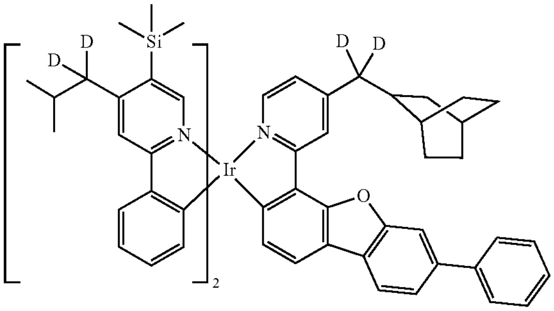
2395
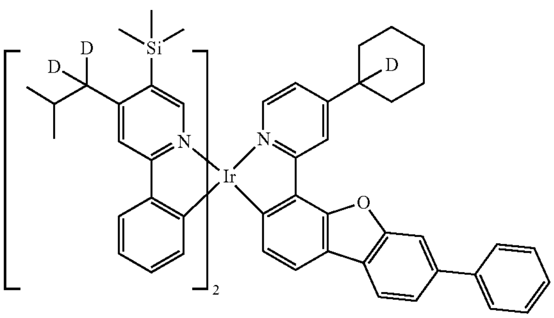
2396
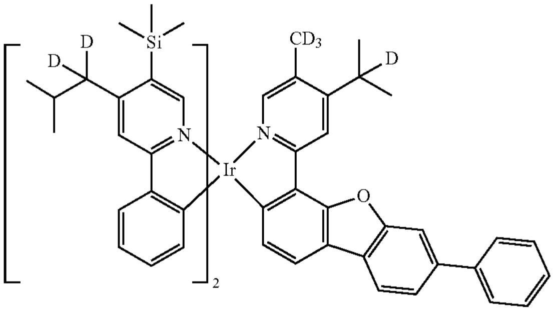
-continued
2397
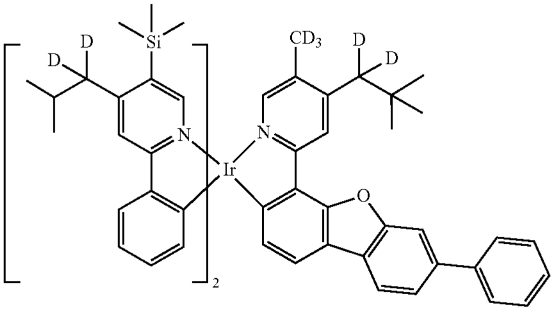
2398
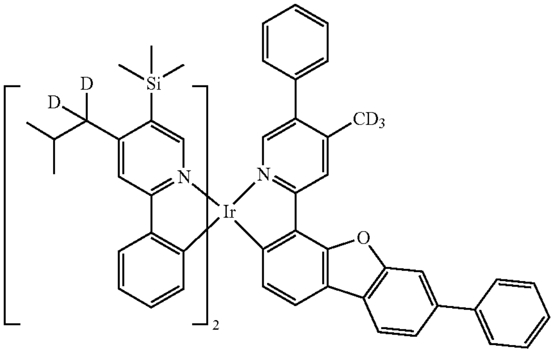
2399
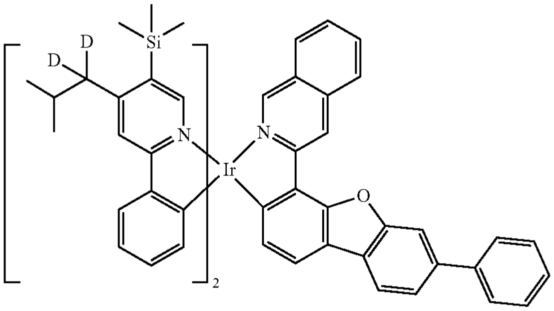
2400
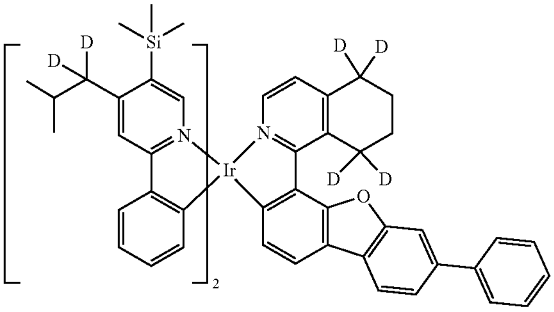

-continued
2401
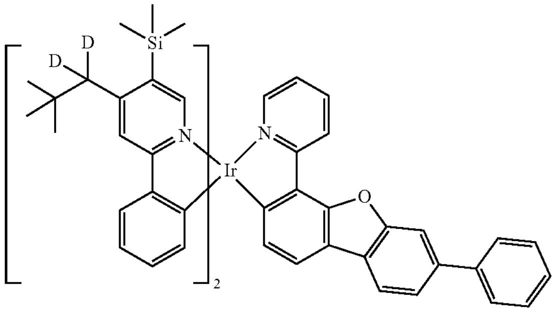
2402
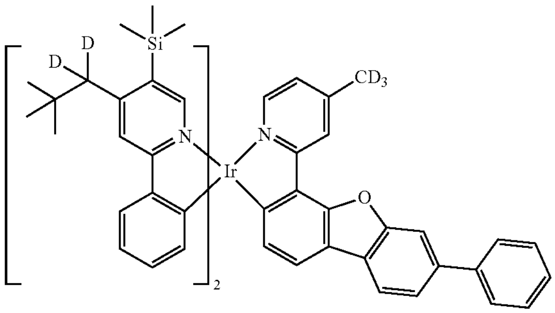
2403
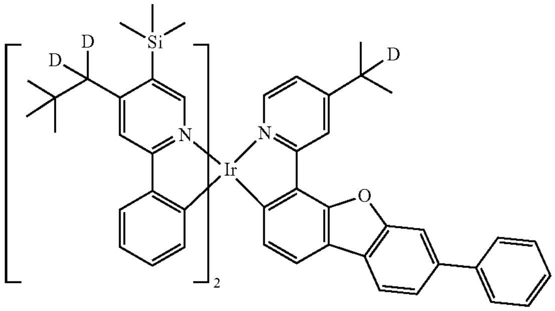
2404
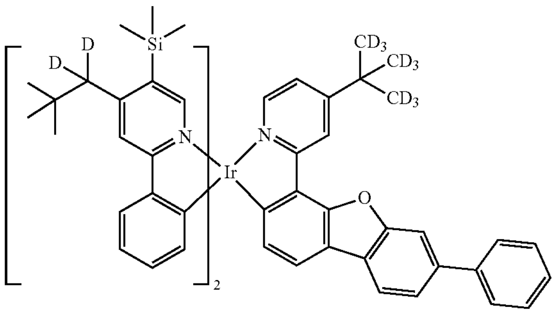
-continued
2405
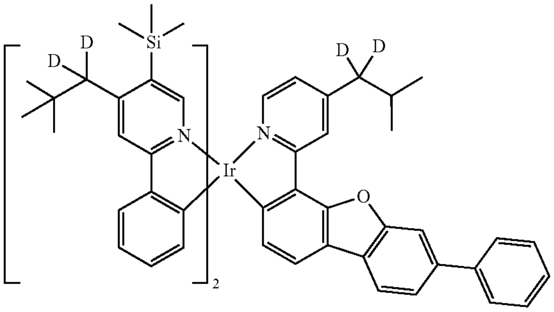
2406
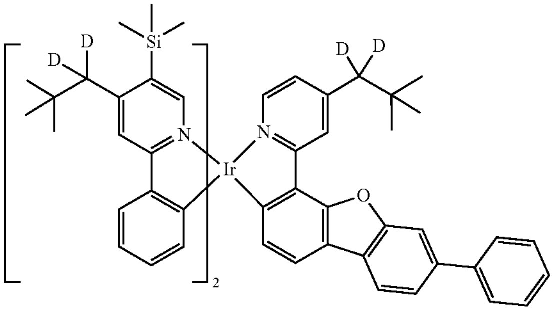
2407
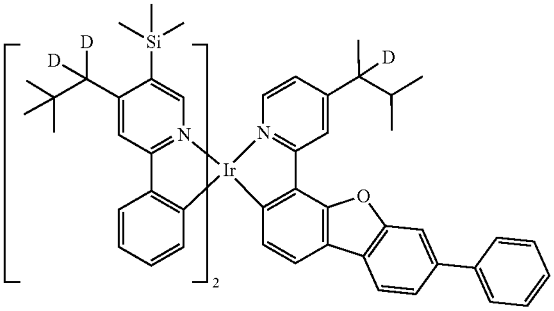
2408
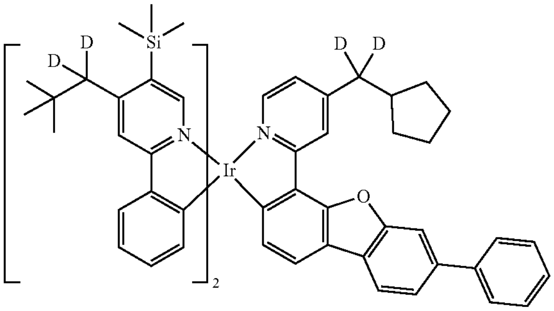

-continued
2409
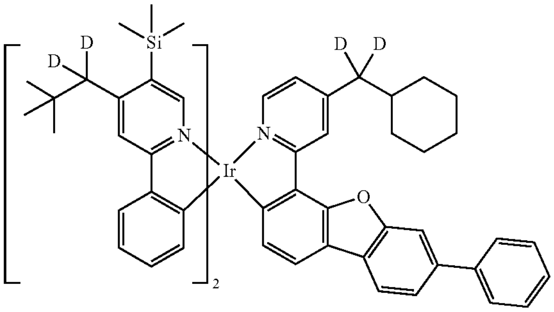
2410
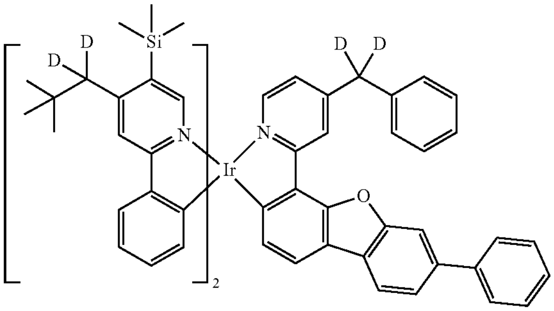
2411
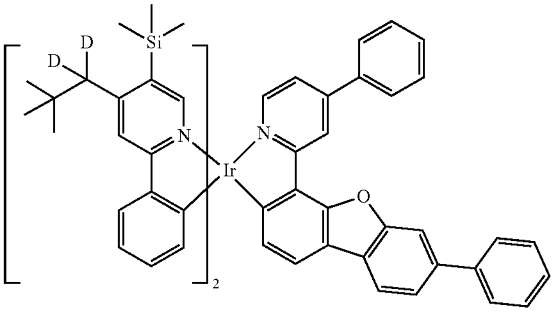
2412
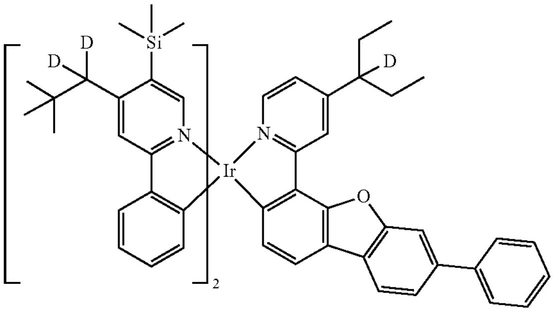
2413
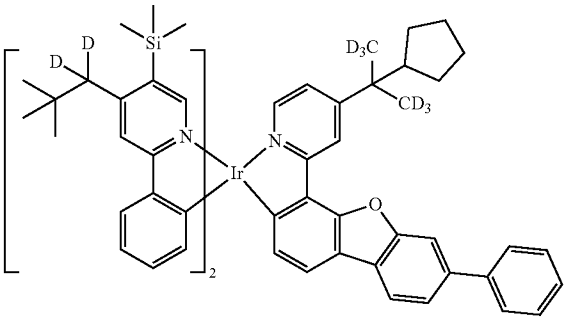
2414
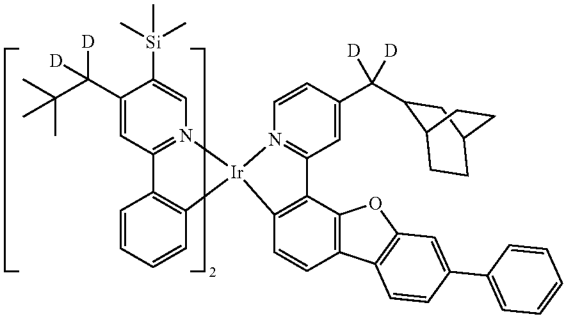
2415
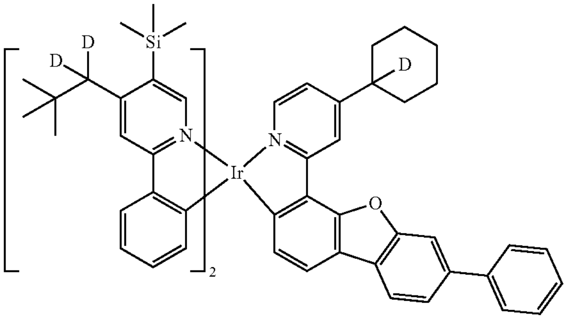
2416
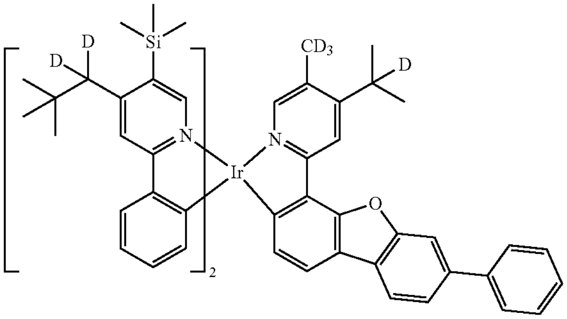

-continued
2417
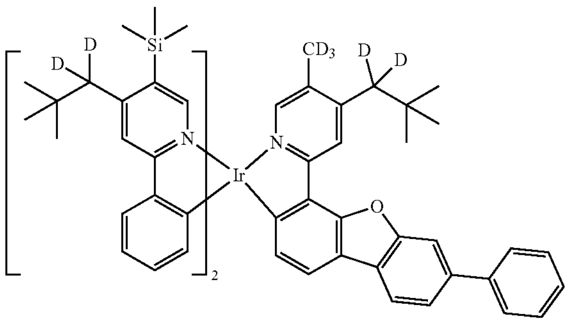
2418
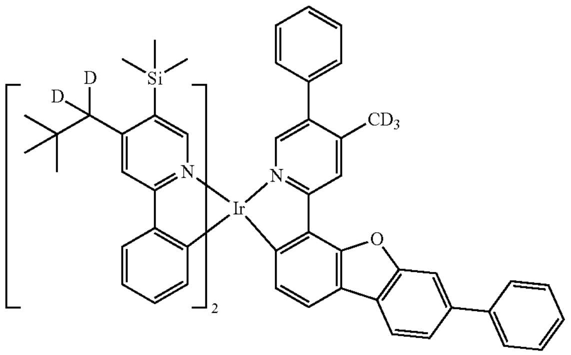
2419
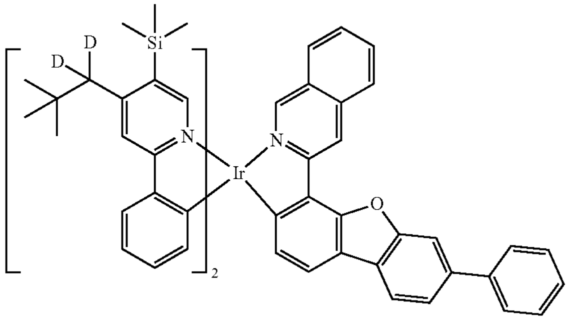
2420
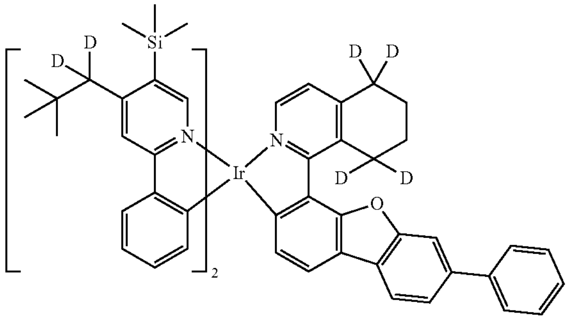
-continued
2421
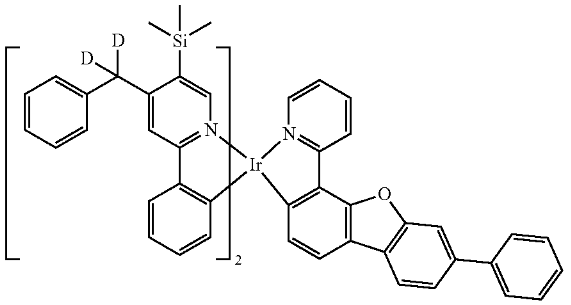
2422
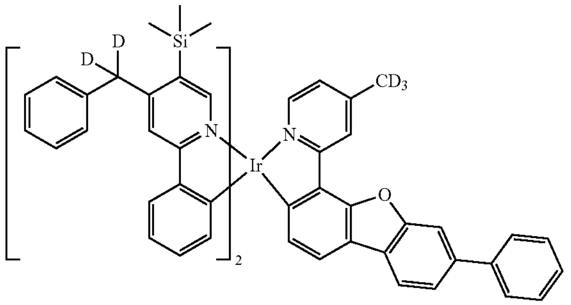
2423
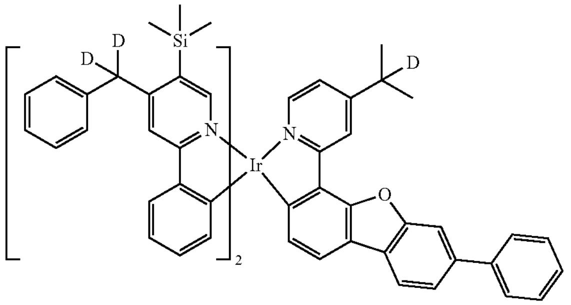
2424
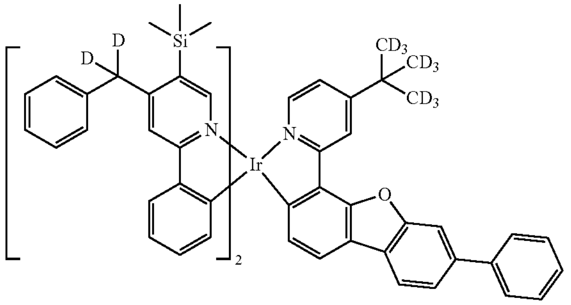
2425
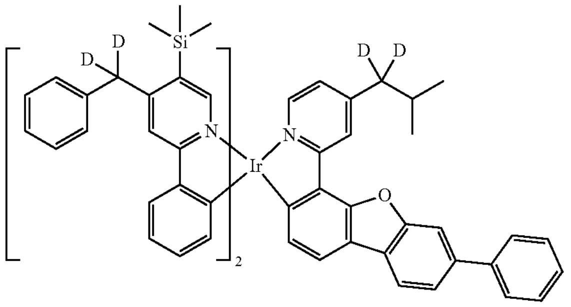

-continued
2426
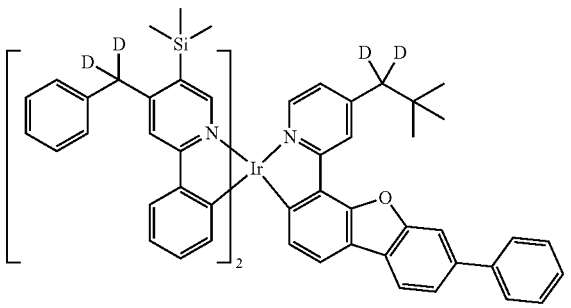
2427
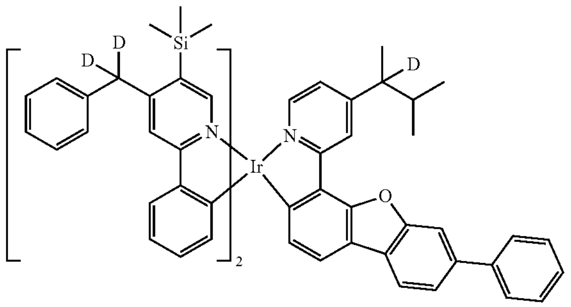
2428
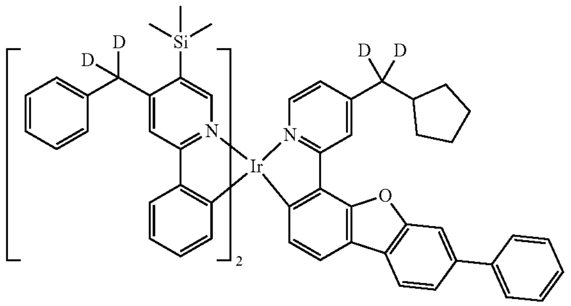
2429
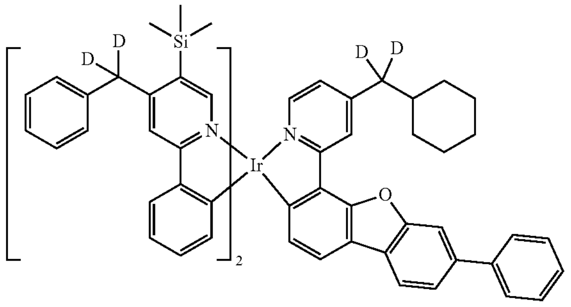
2430
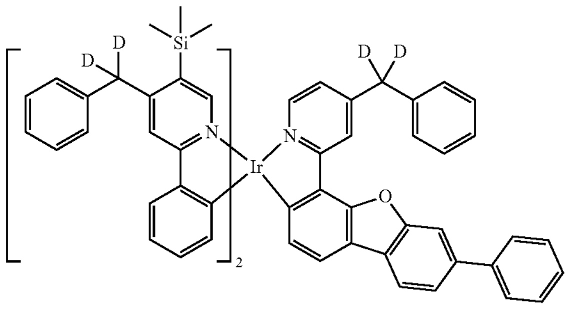
-continued
2431
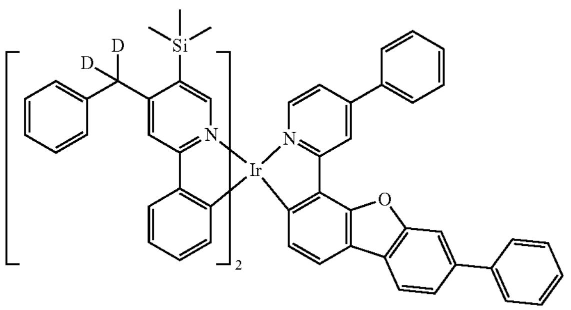
2432
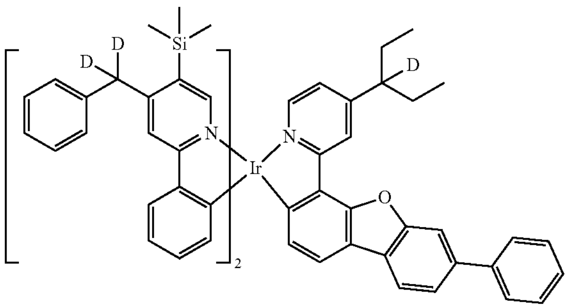
2433
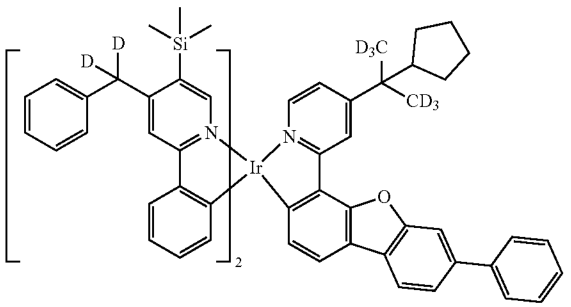
2434
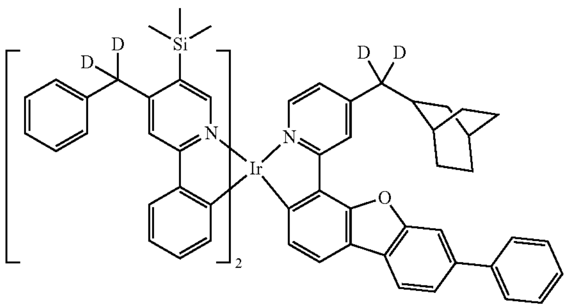
2435
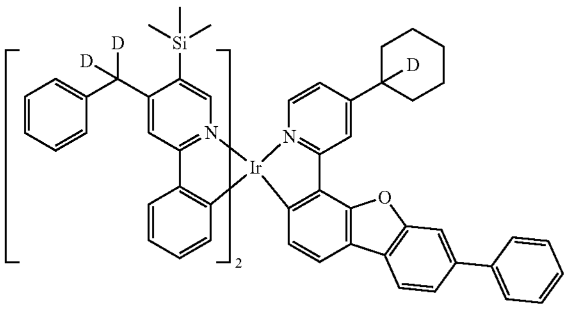

-continued
2436
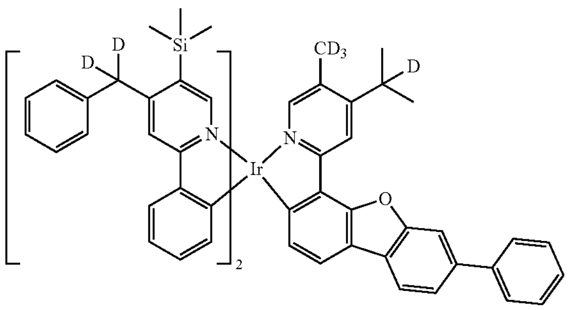
2437
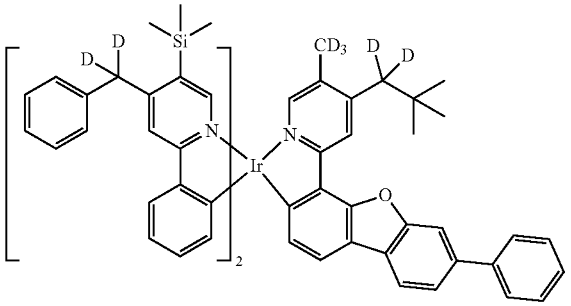
2438
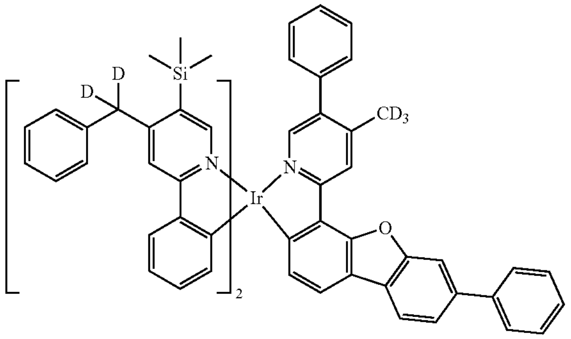
2439
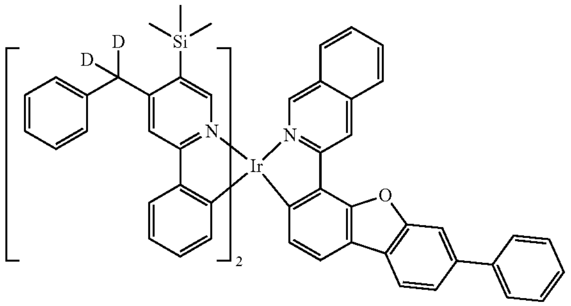
-continued
2440
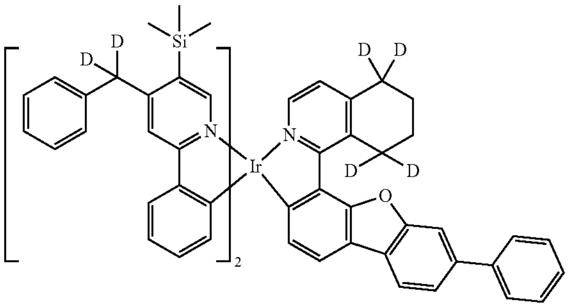
2441
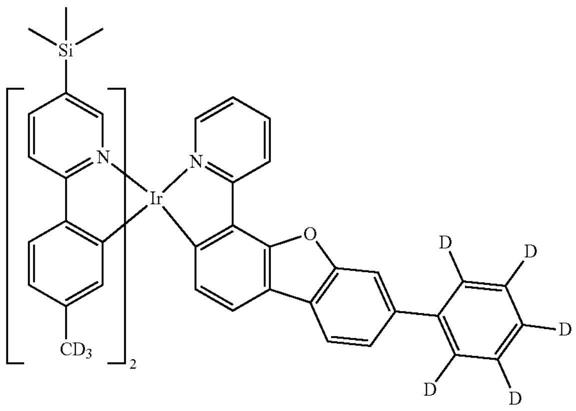
2442
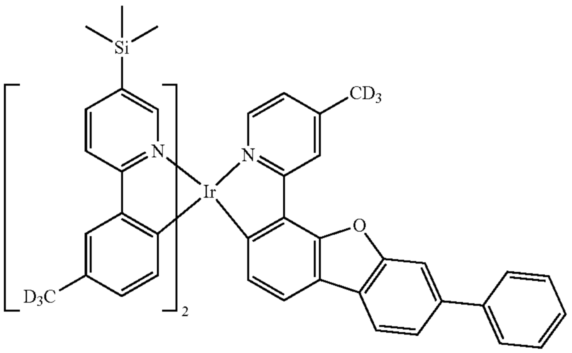
2443
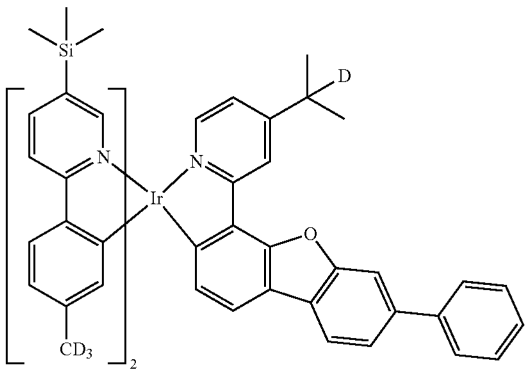

2444
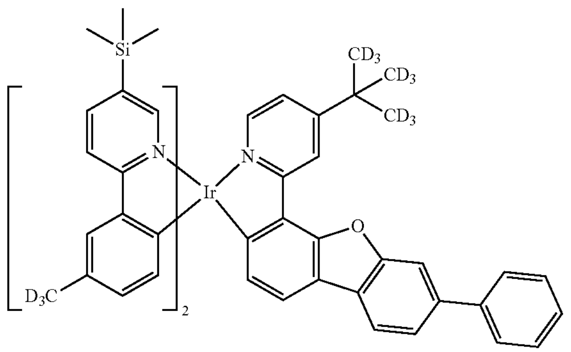
2445
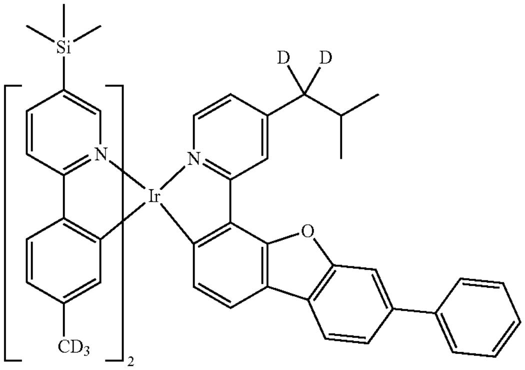
2446
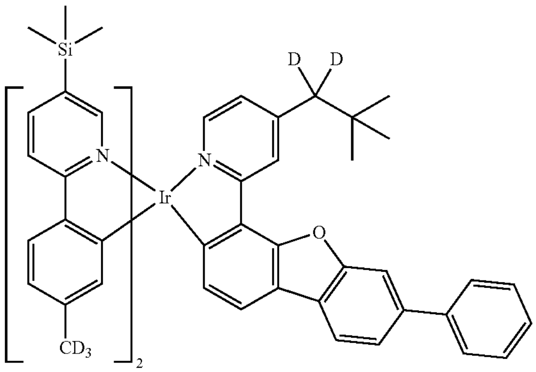
2447
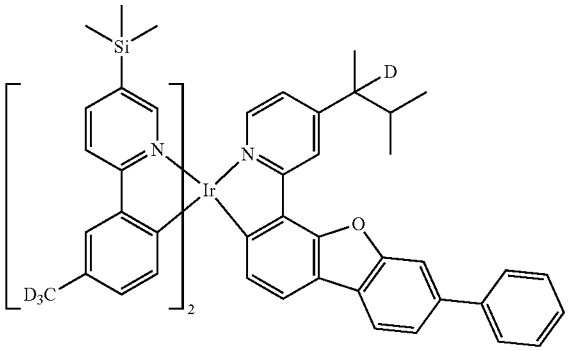
2448
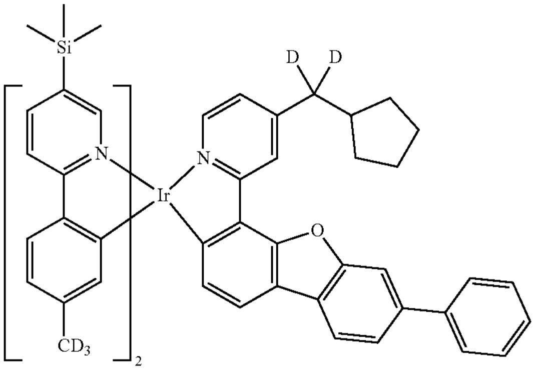
2449
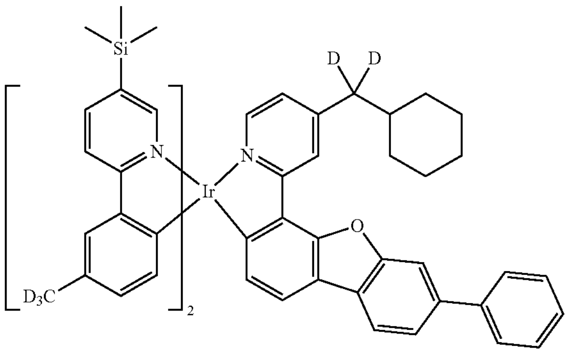
2450
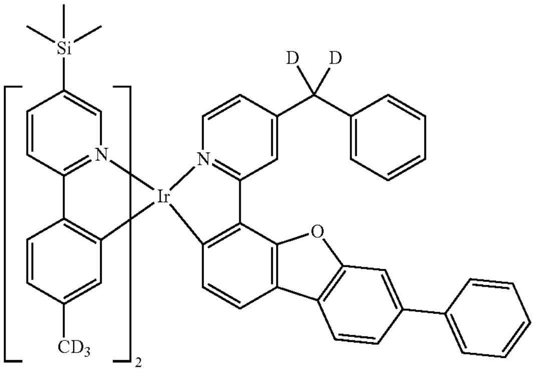
2451
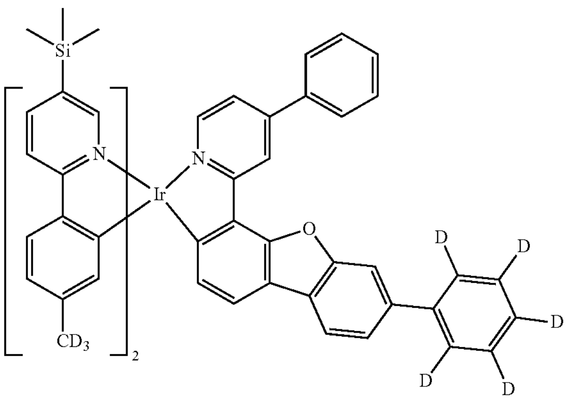

-continued
2452
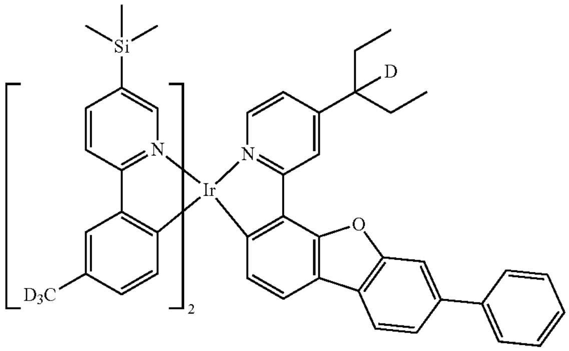
2453
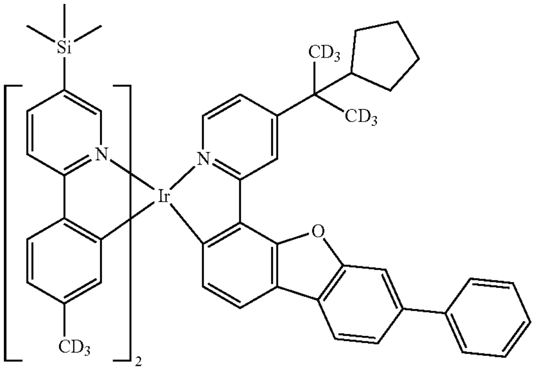
2454
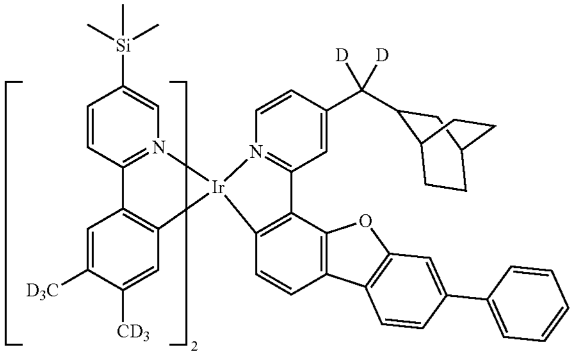
2455
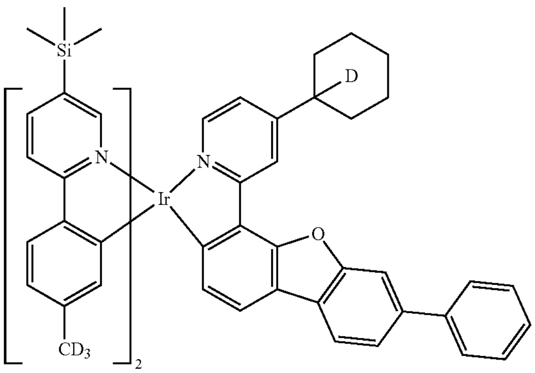
-continued
2456
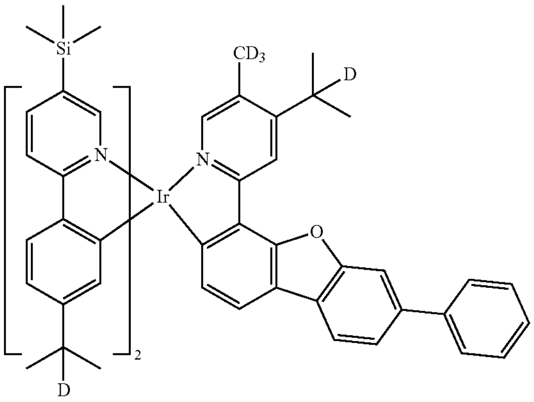
2457
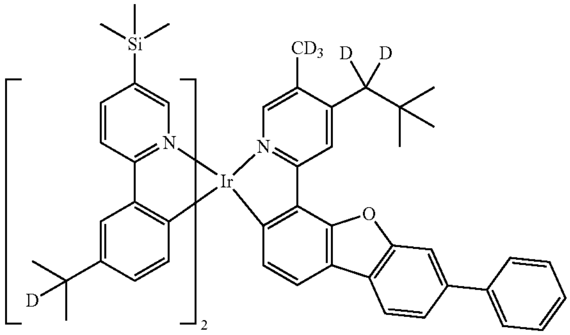
2458
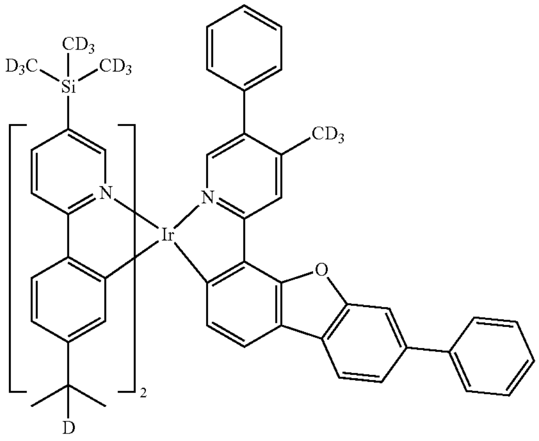
2459
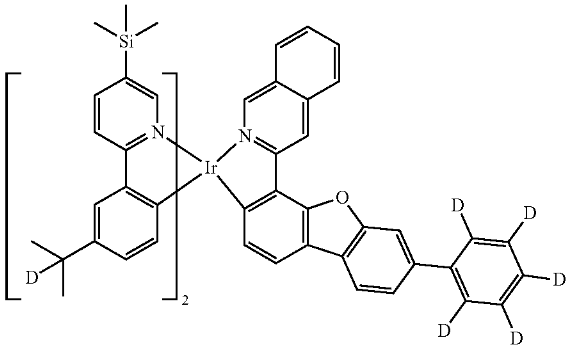

-continued
2460
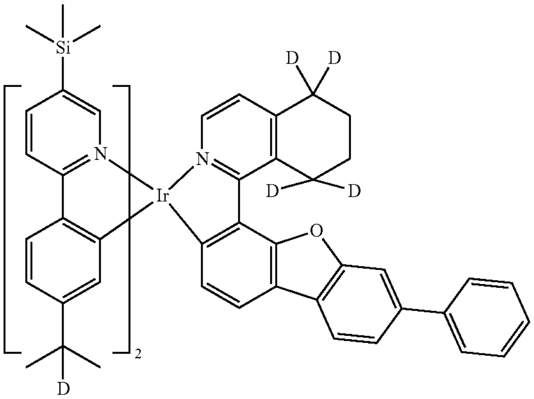
2461
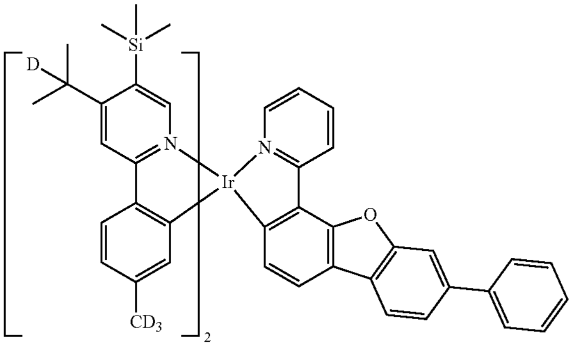
2462
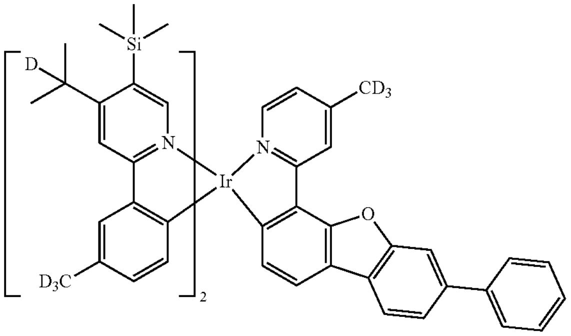
2463
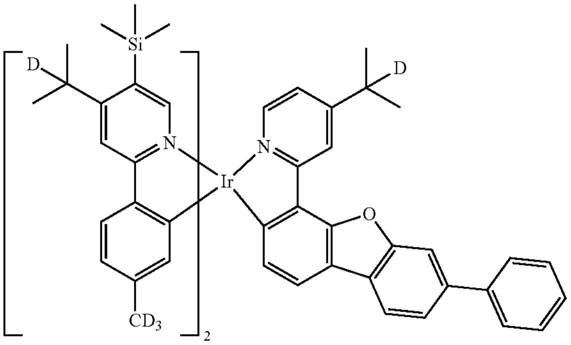
-continued
2464
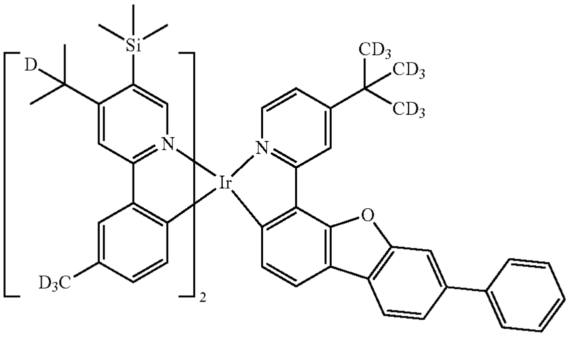
2465
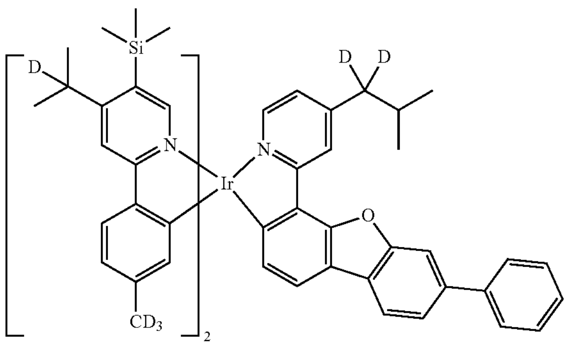
2466
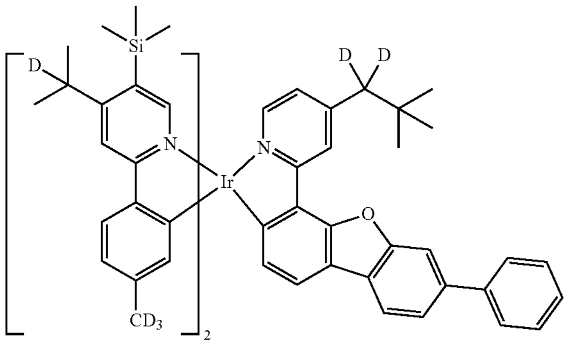
2467
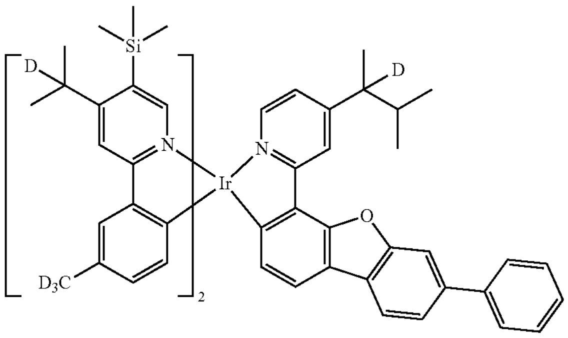

2468
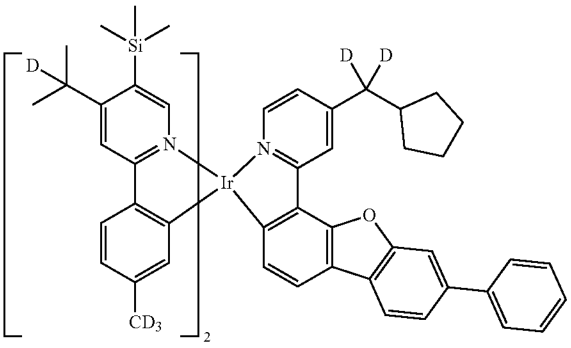
2469
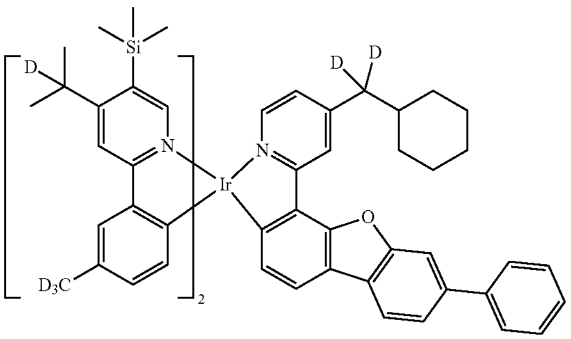
2470
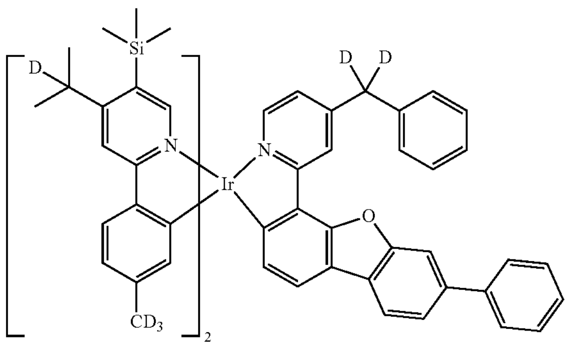
2471
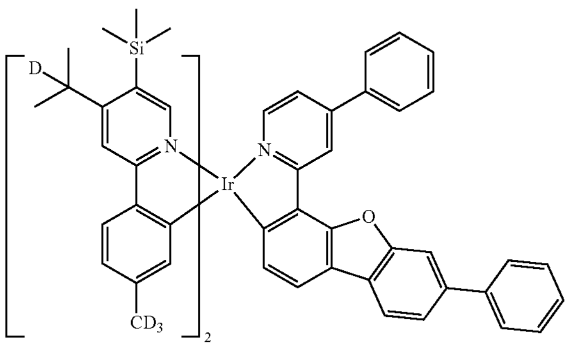
2472
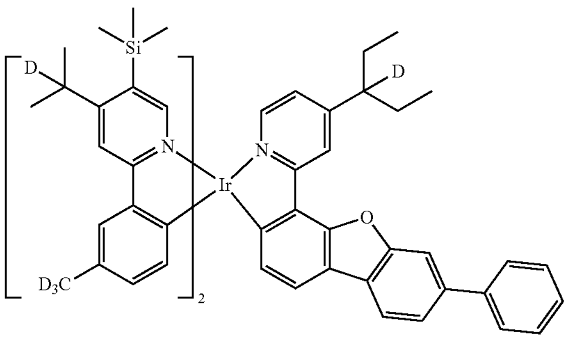
2473
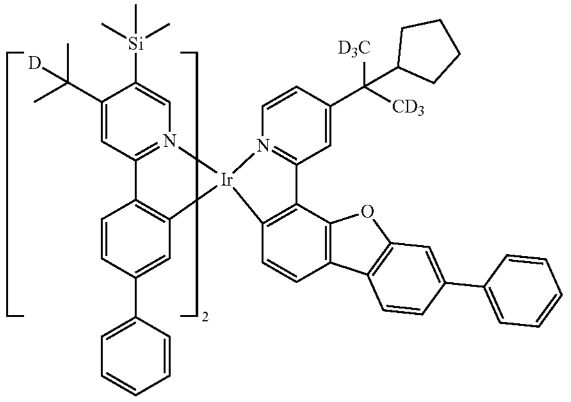
2474
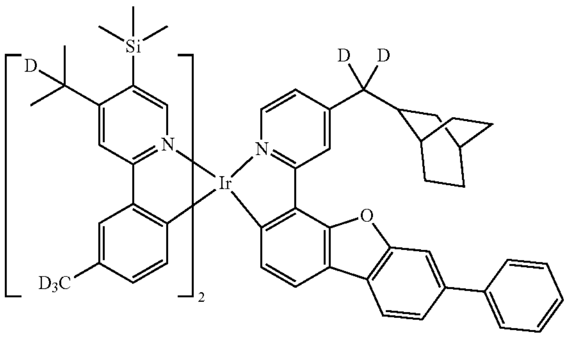
2475
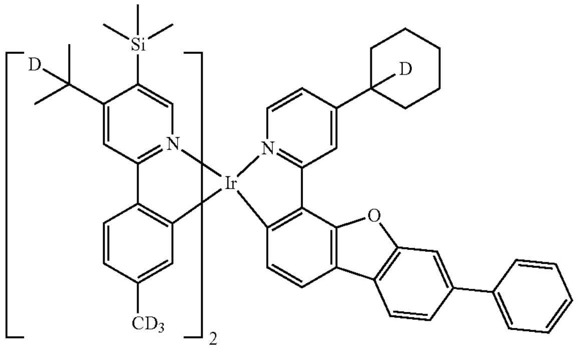

2476
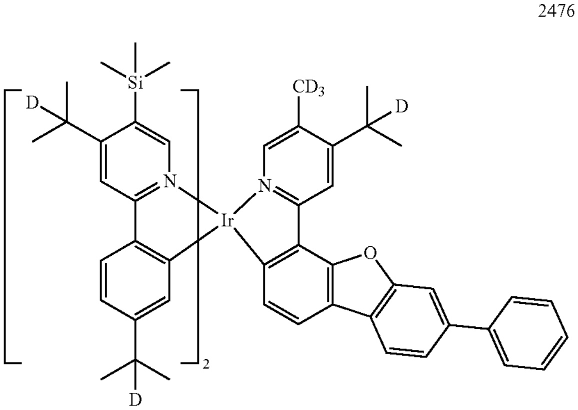
2477
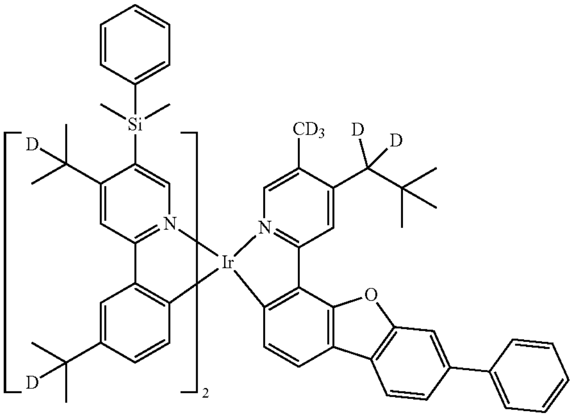
2478
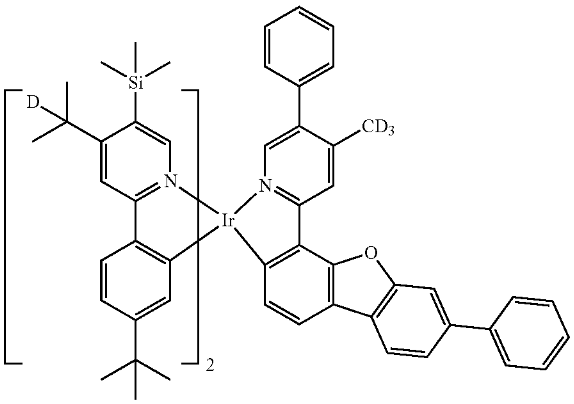
2479
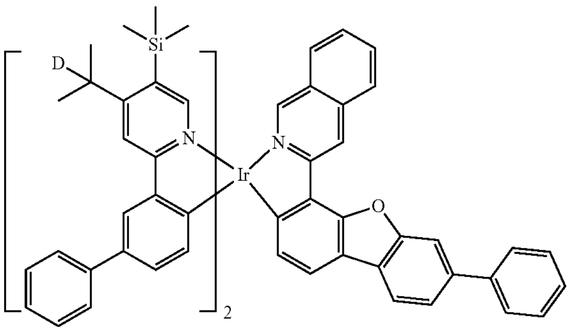
2480
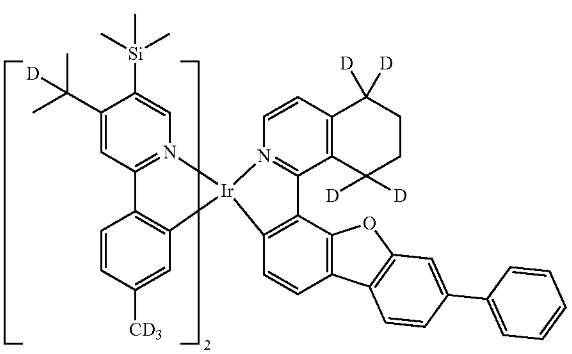
2481
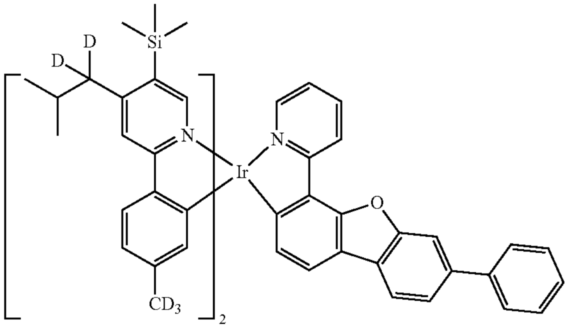
2482
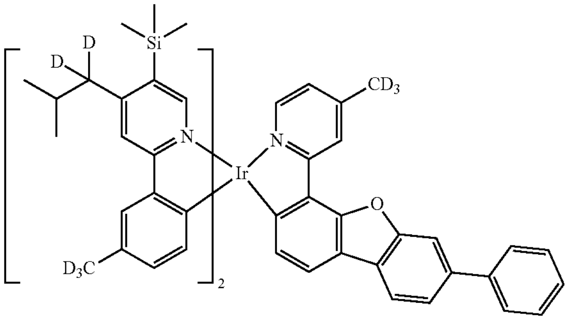
2483
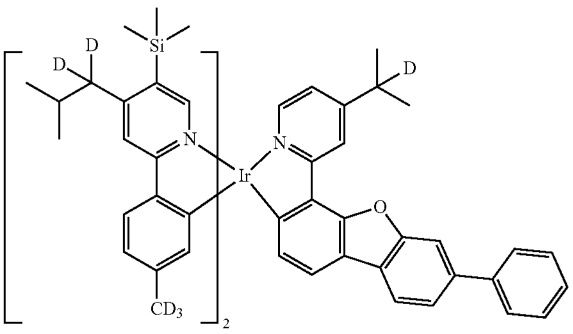

-continued
2484
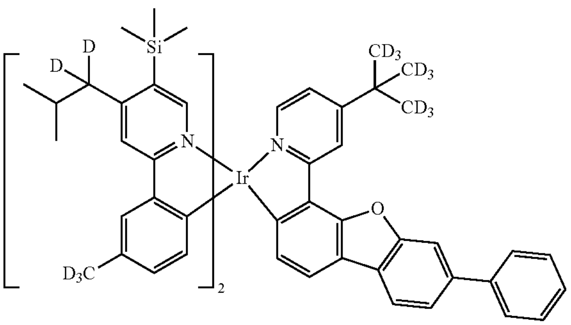
2488
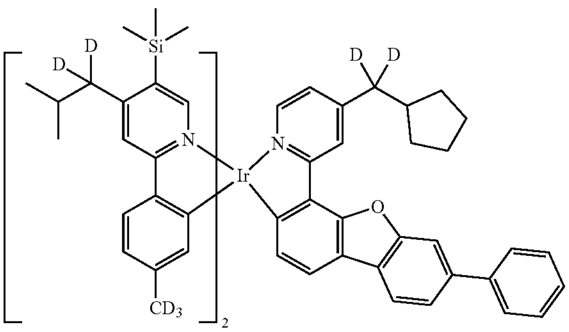
2485
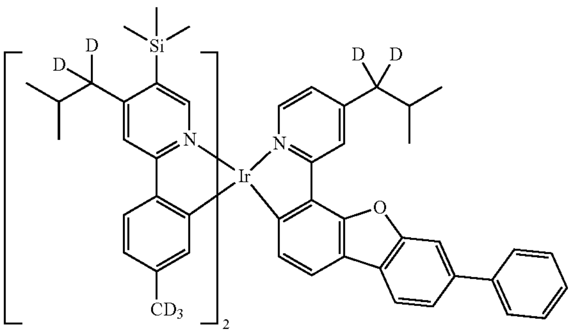
2489
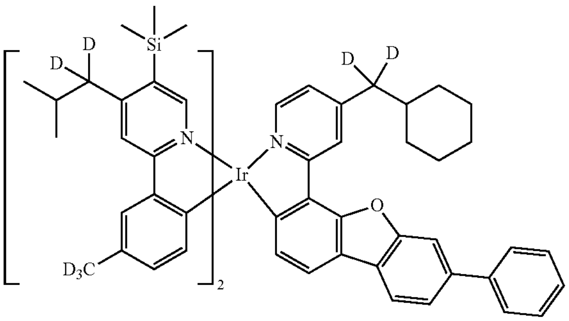
2486
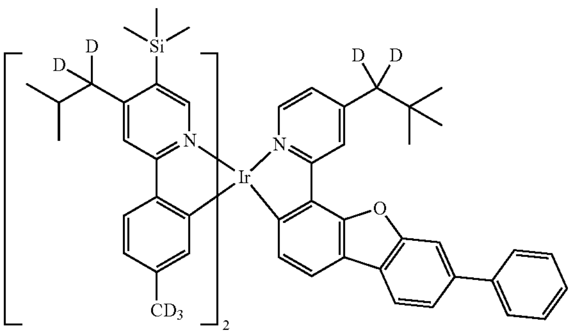
2490
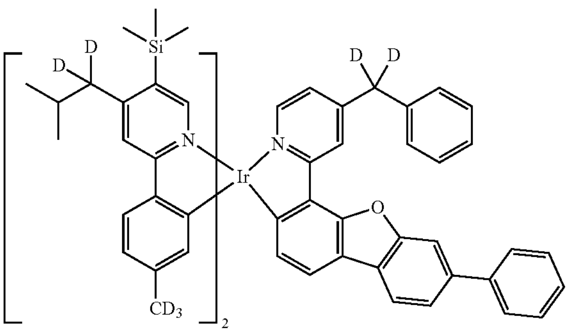
2487
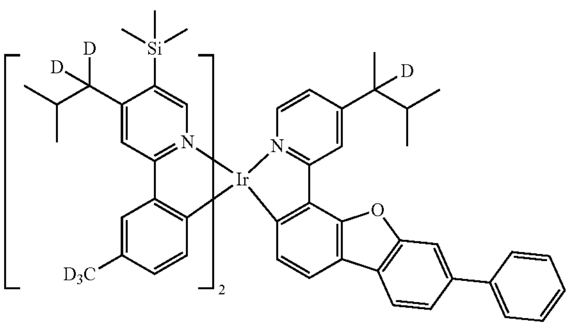
2491
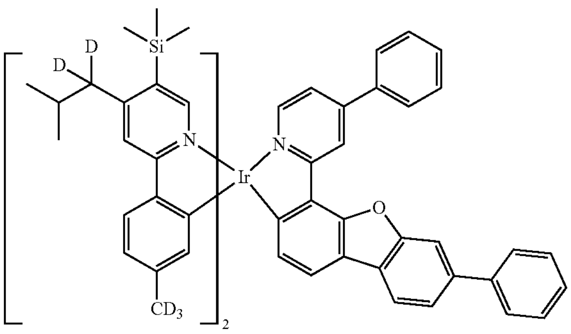

-continued
2492
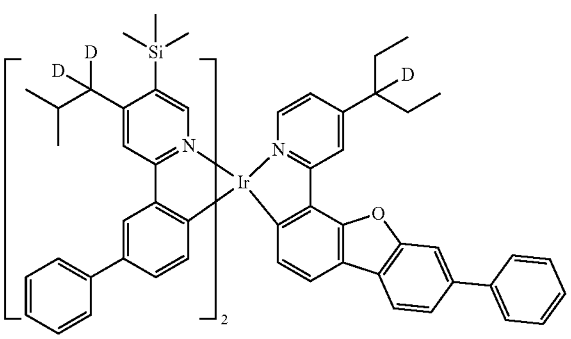
2493
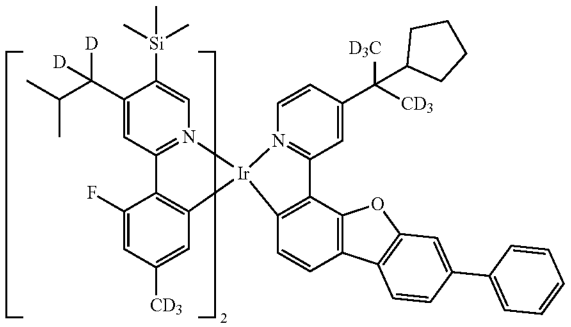
2494
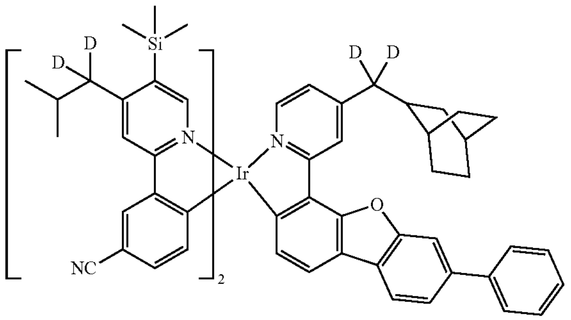
2495
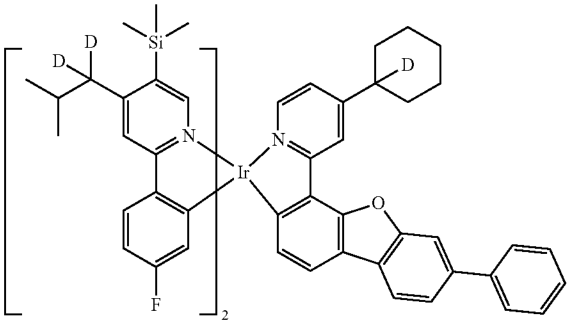
-continued
2496
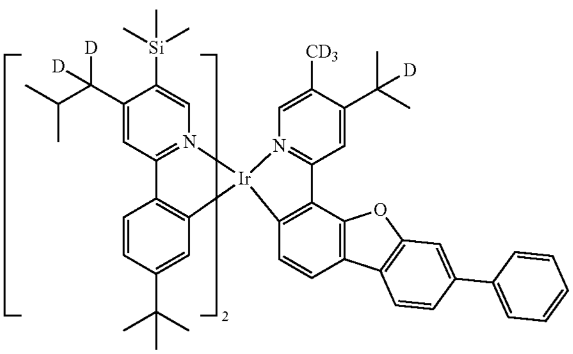
2497
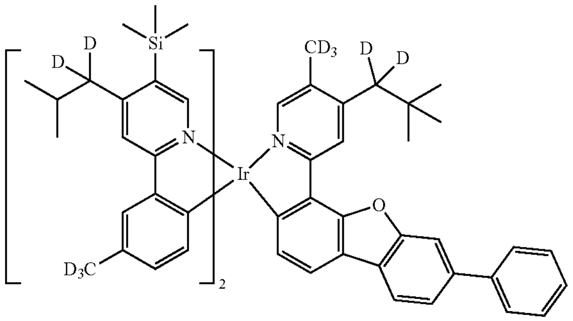
2498
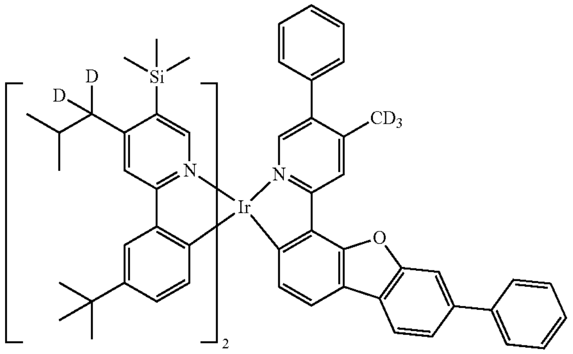
2499
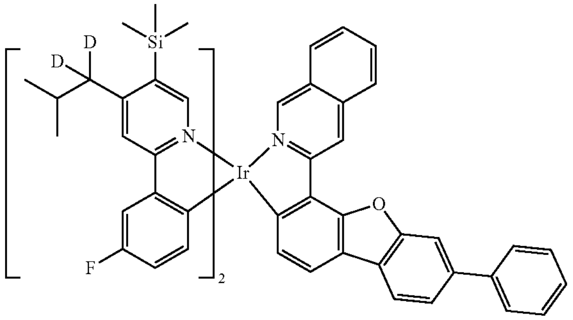

2500
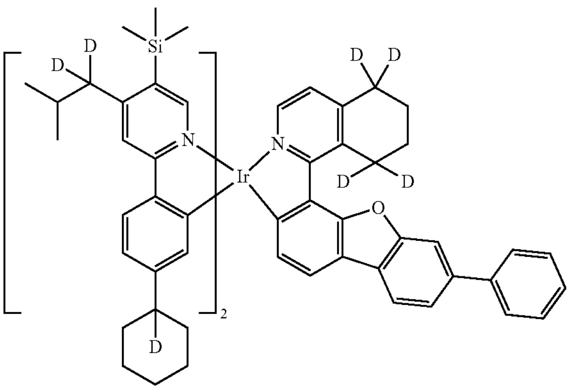
2501
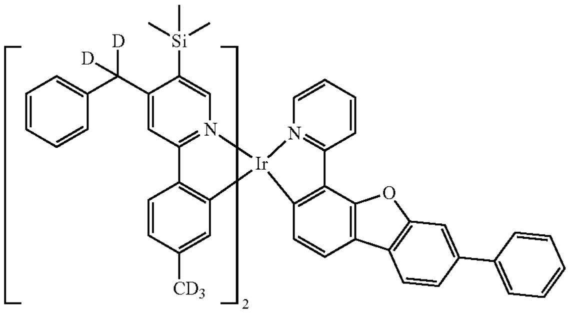
2502
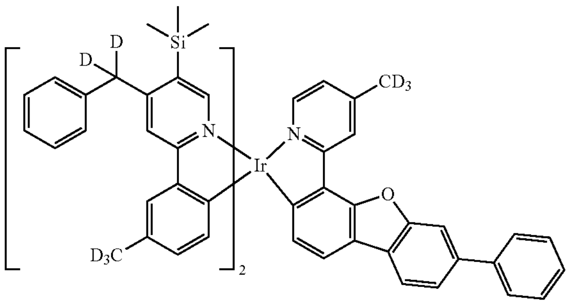
2503
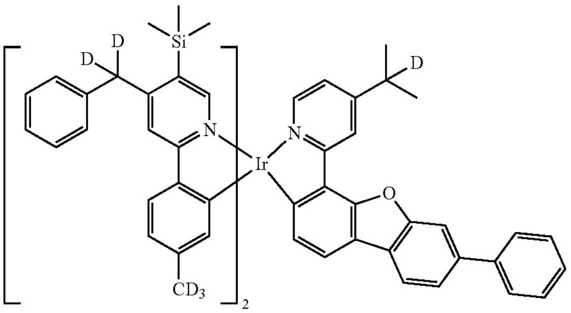
2504
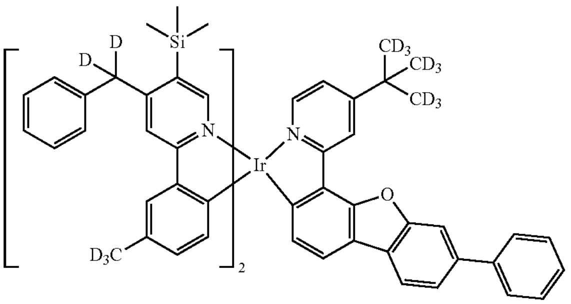
2505
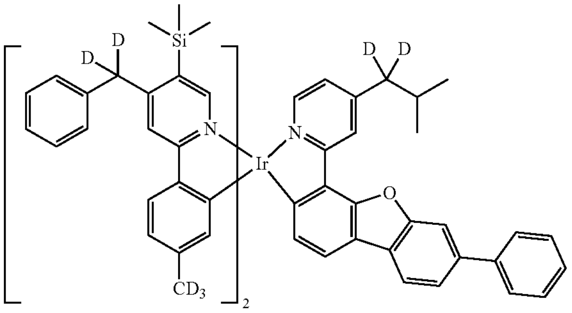
2506
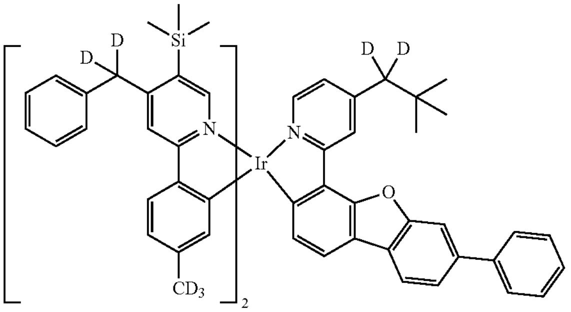
2507
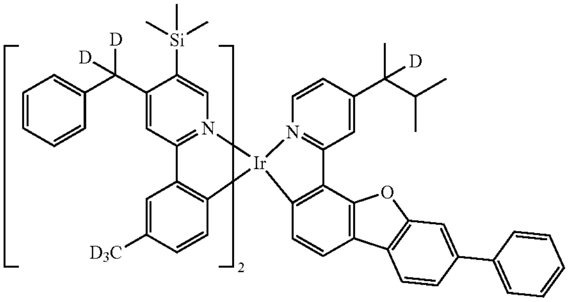
2508
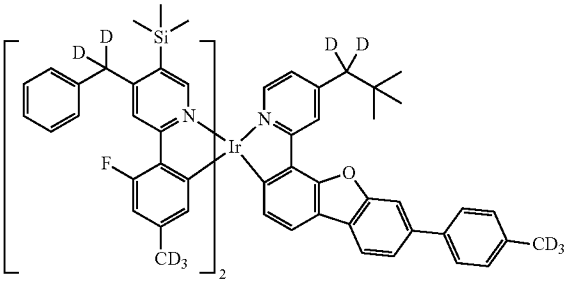

-continued
2509
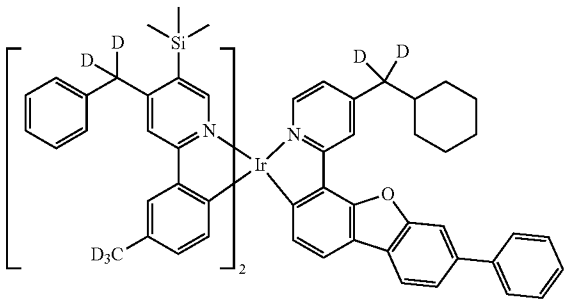
2510
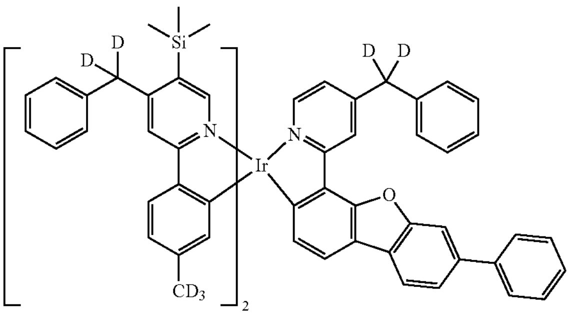
2511
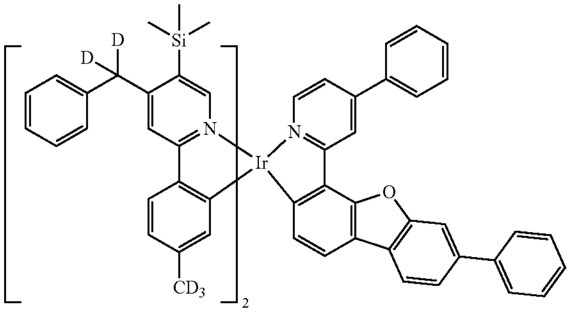
2512
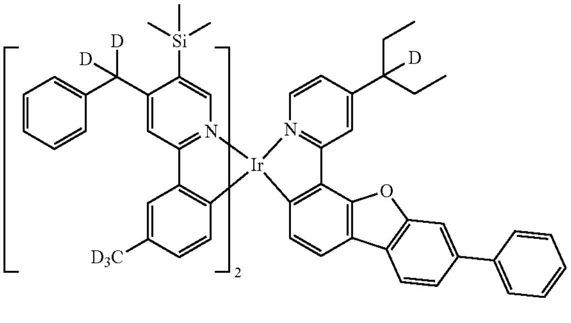
-continued
2513
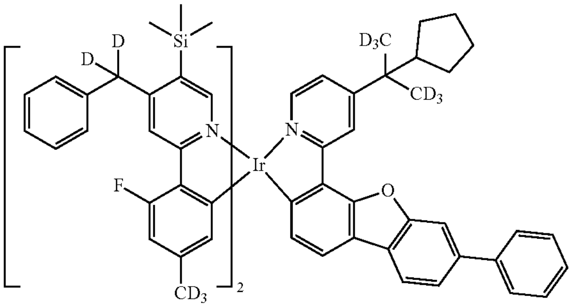
2514
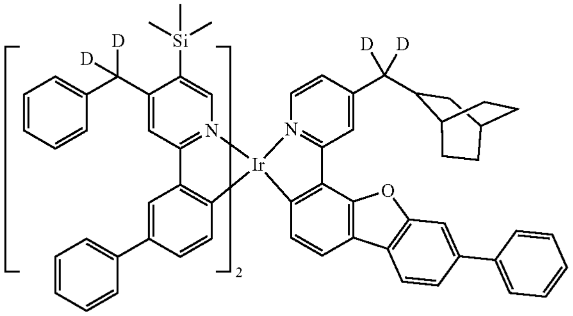
2515
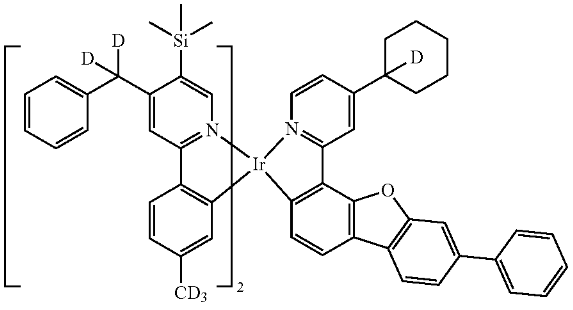
2516
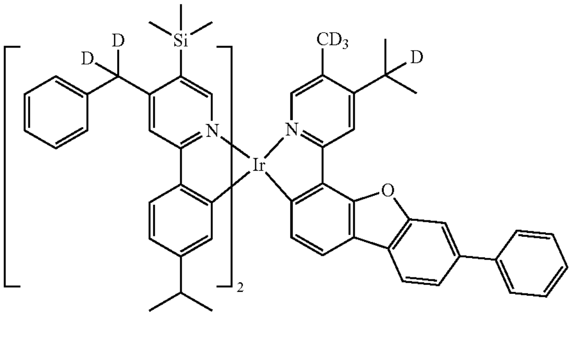

2517
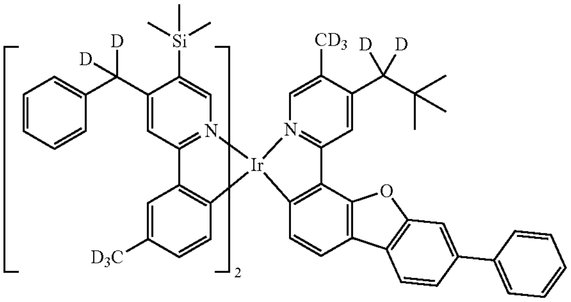
2518
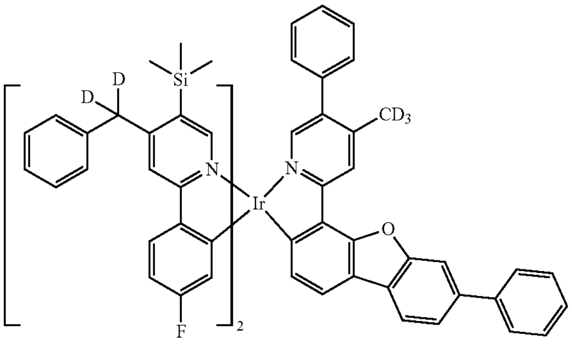
2519
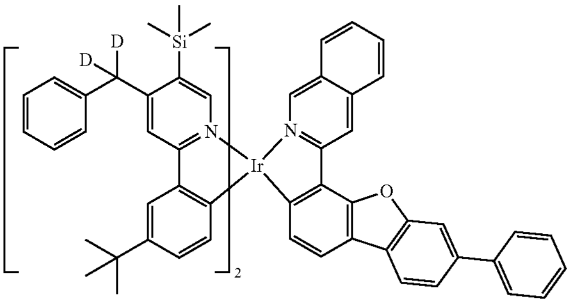
2520
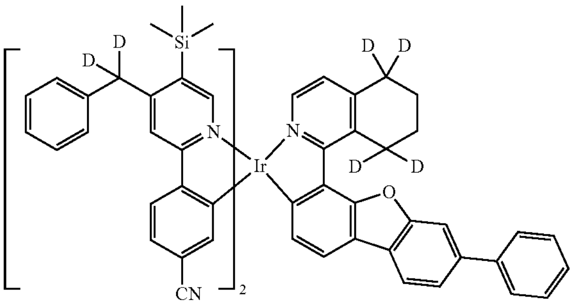
2521
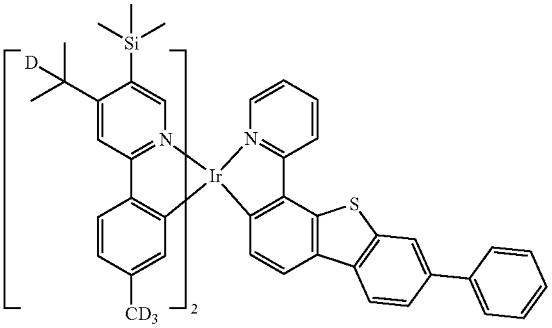
2522
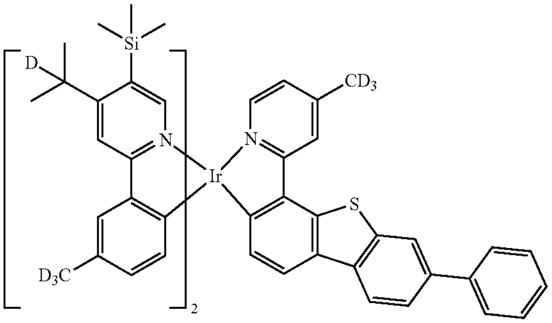
2523
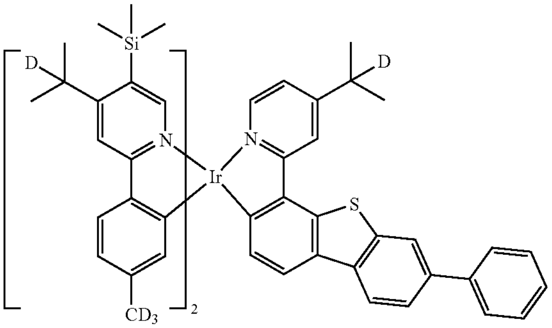
2524
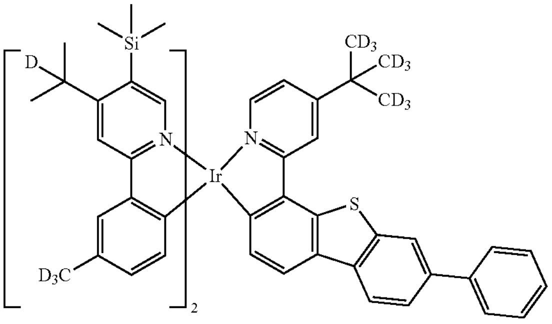

-continued
2525
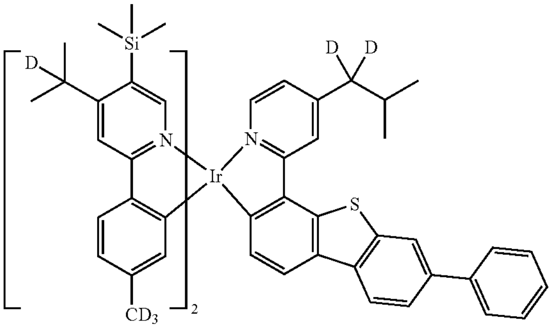
2526
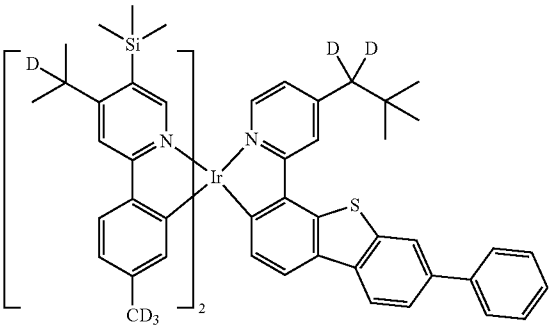
2527
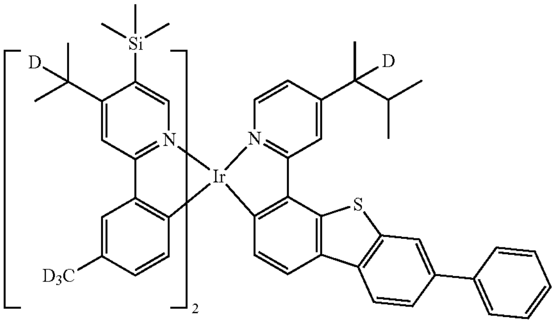
2528
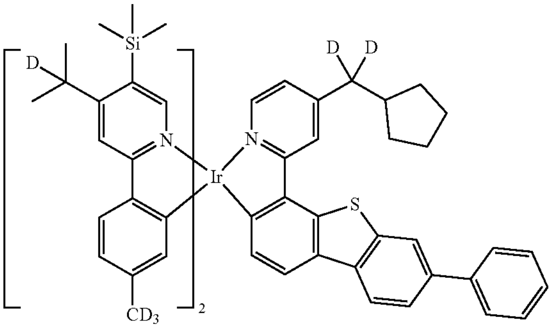
-continued
2529
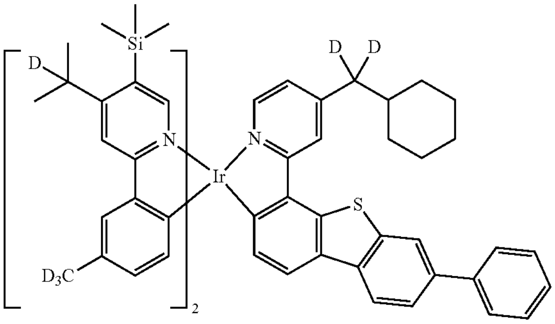
2530
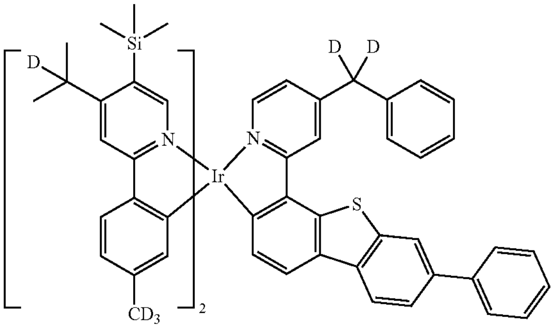
2531
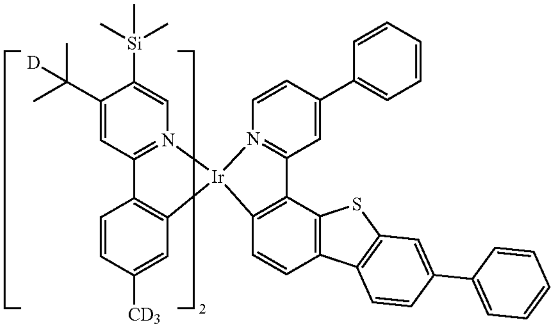
2532
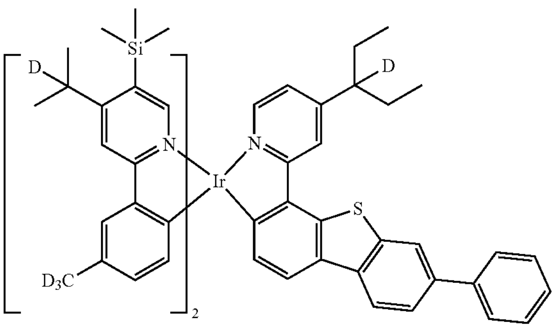

-continued
2533
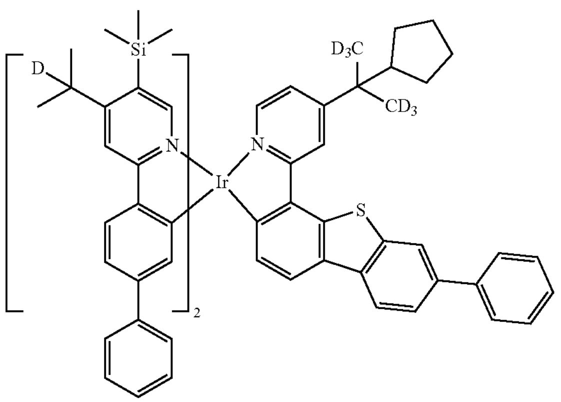
2534
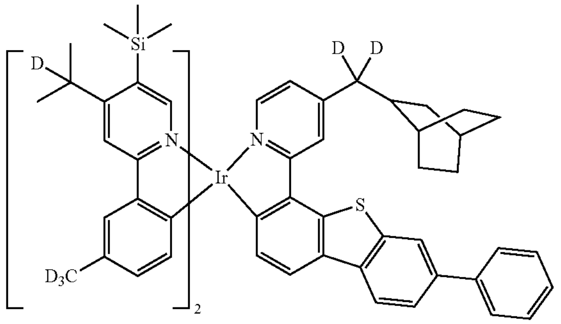
2535
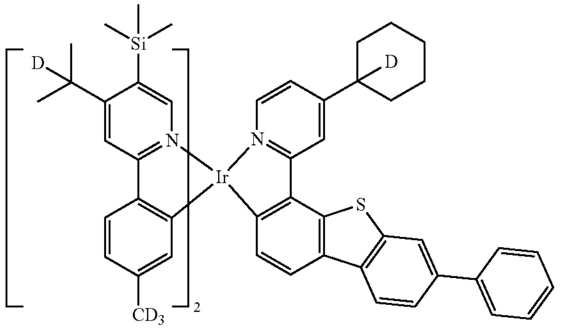
2536
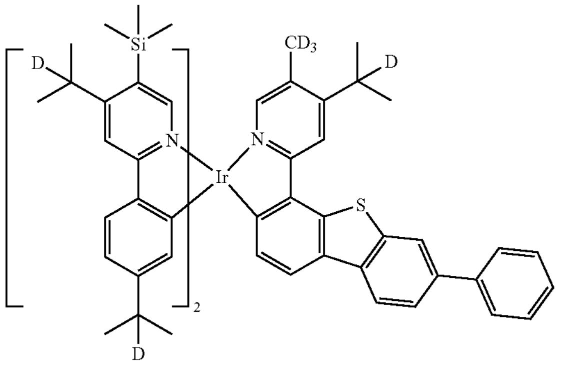
-continued
2537
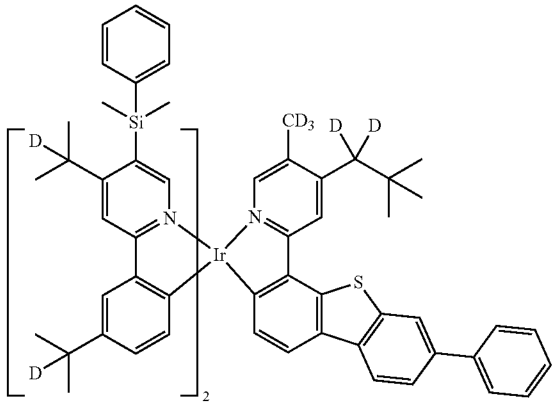
2538
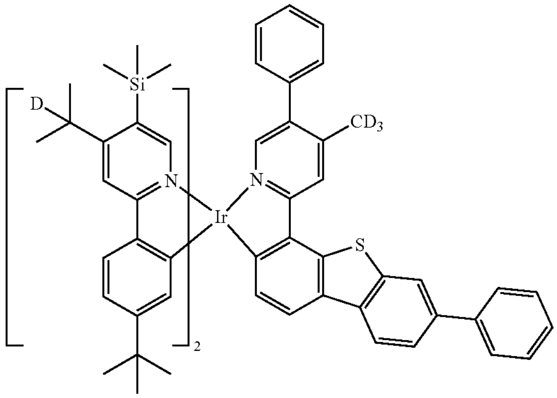
2539
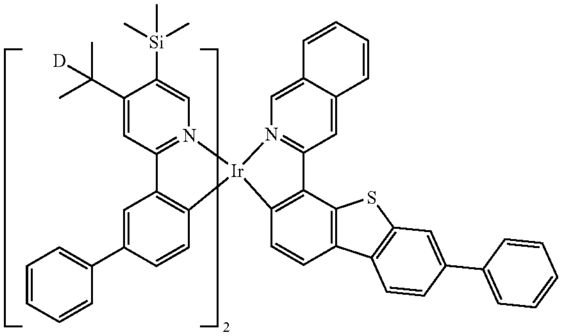
2540
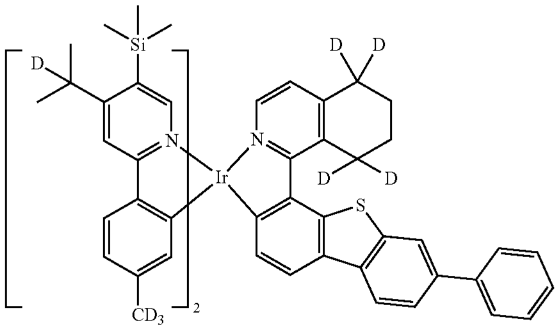

2541
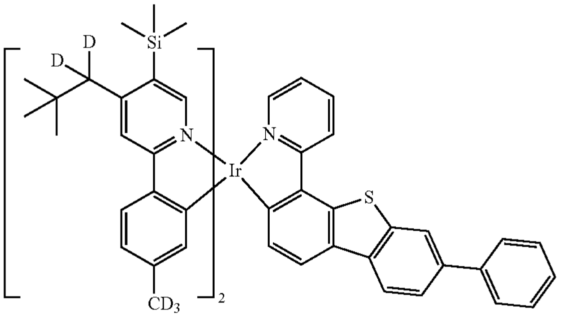
2542
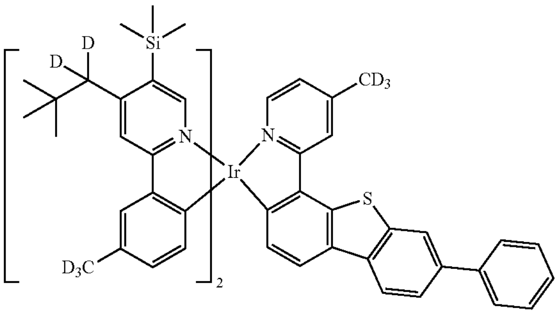
2543
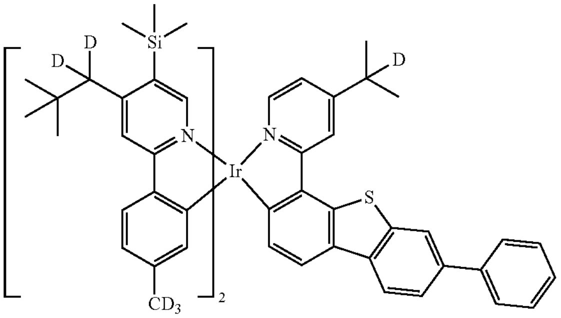
2544
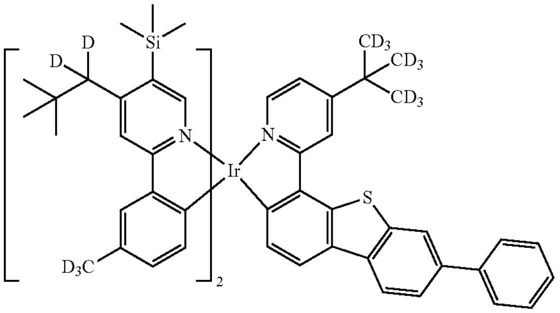
2545
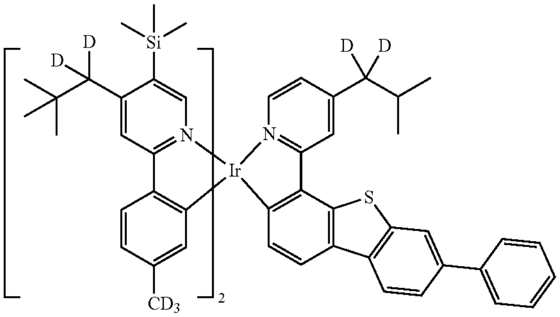
2546
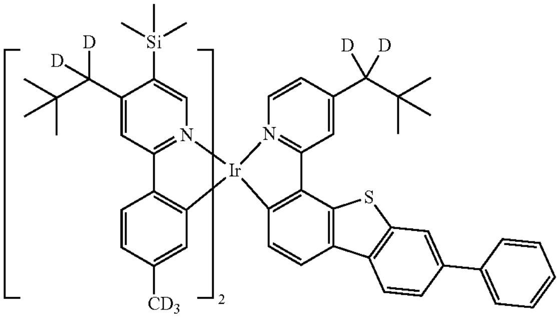
2547
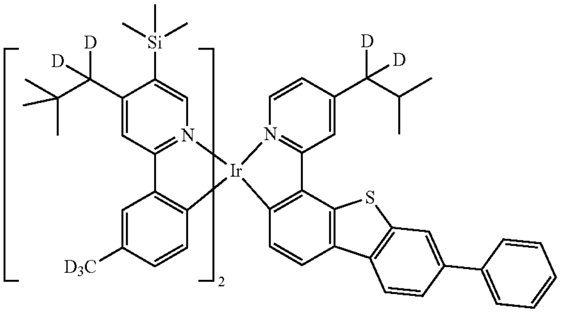
2548
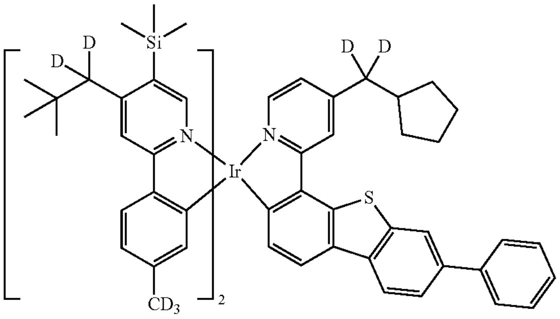

-continued
2549
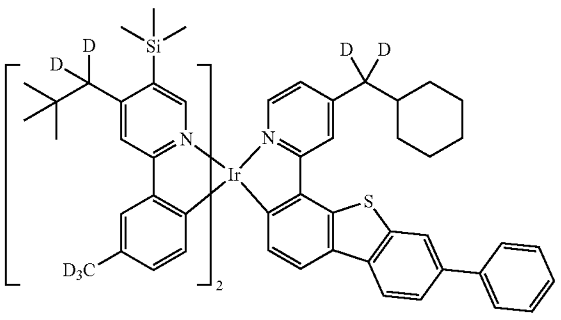
2550
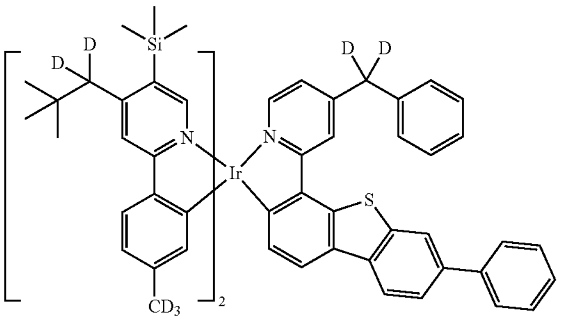
2551
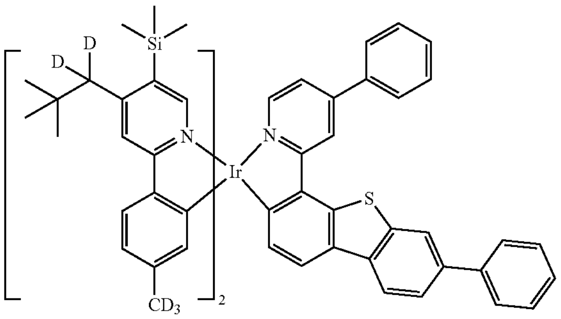
2552
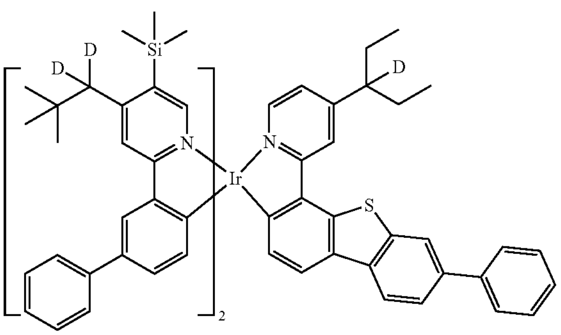
-continued
2553
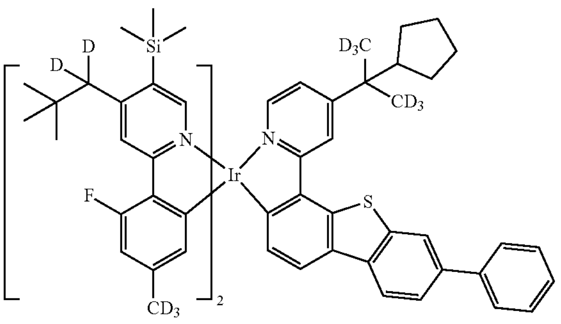
2554
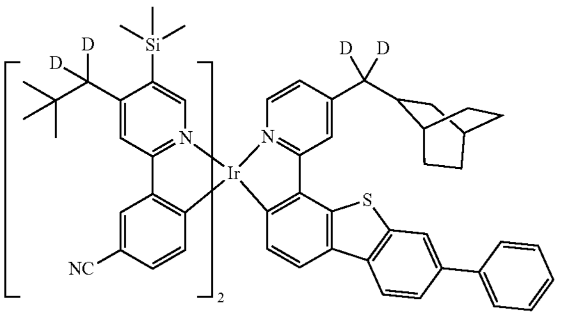
2555
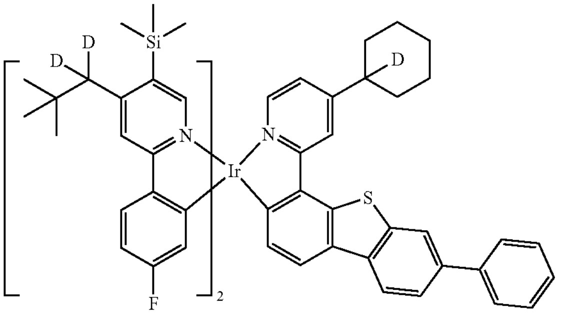
2556
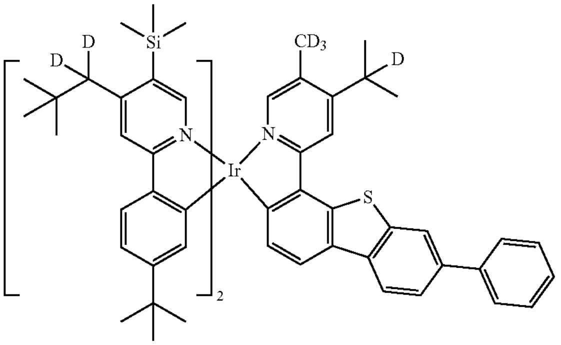

-continued
2557
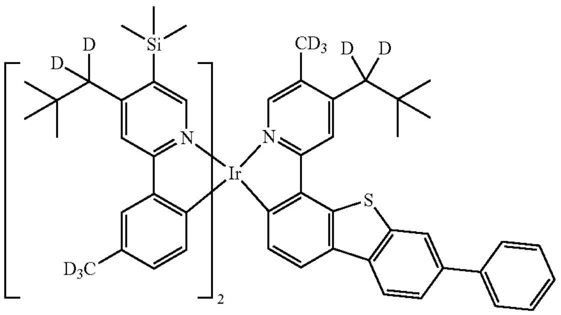
2558
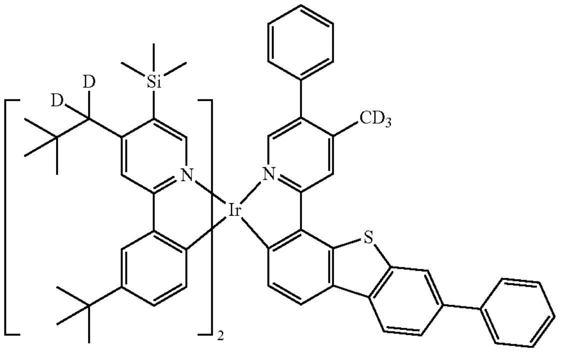
2559
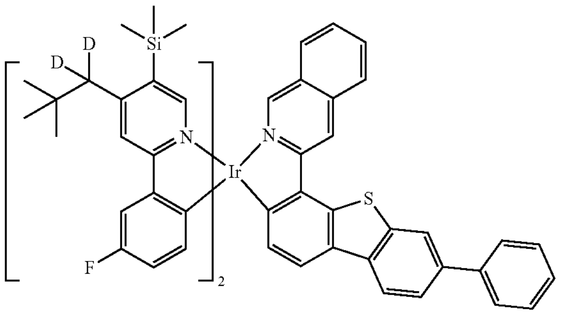
2560
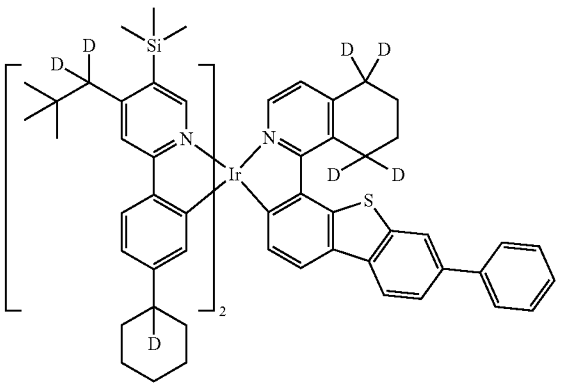
-continued
2561
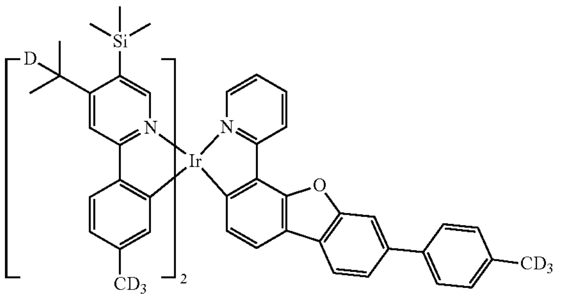
2562
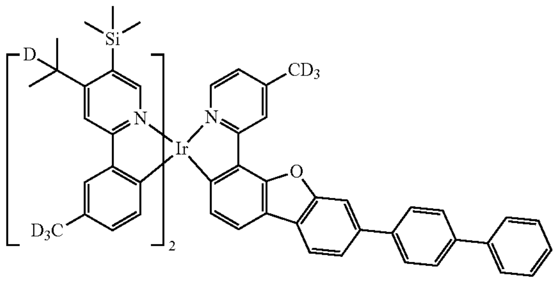
2563
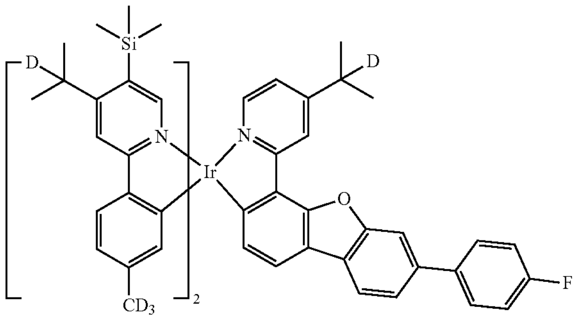
2564
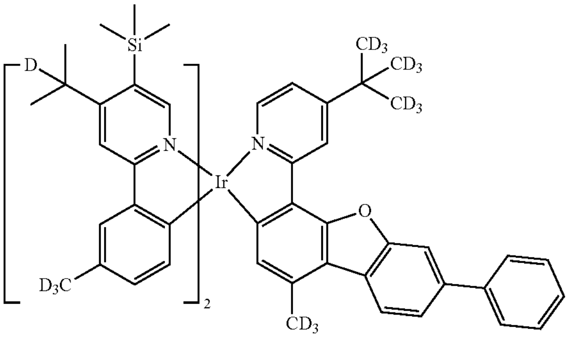

2565
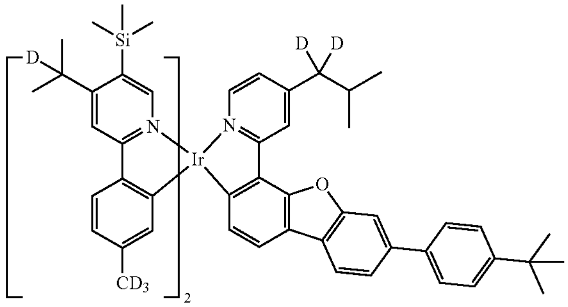
2566
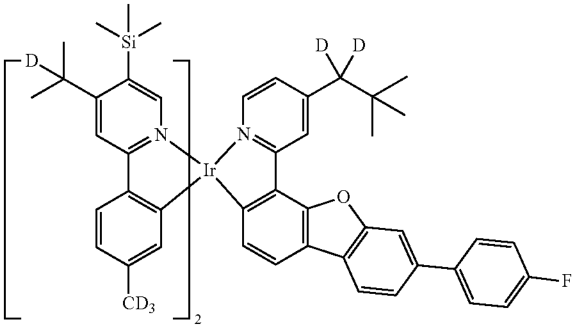
2567
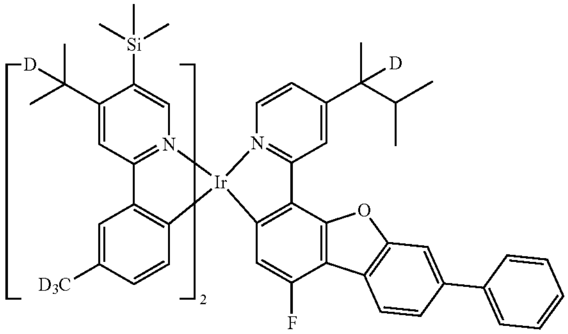
2568
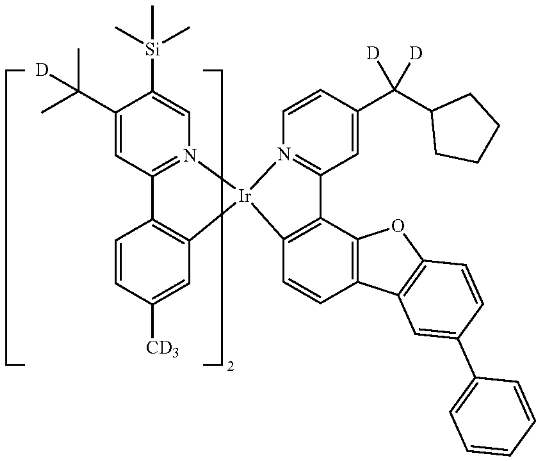
2569
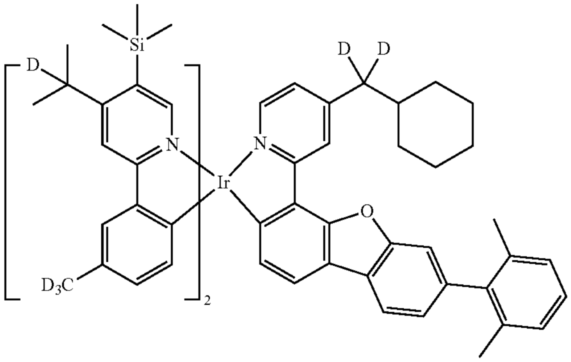
2570
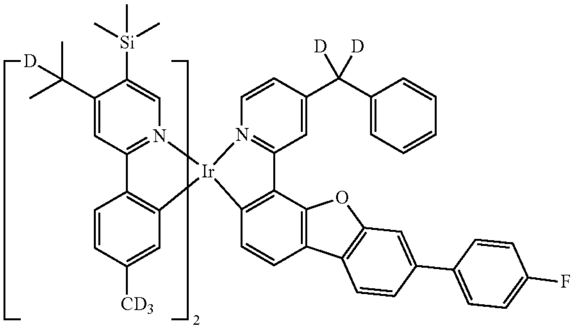
2571
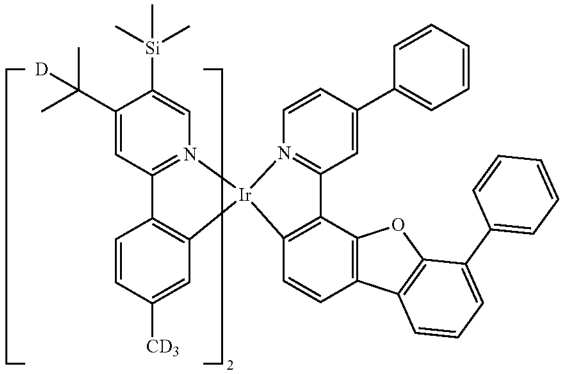
2572
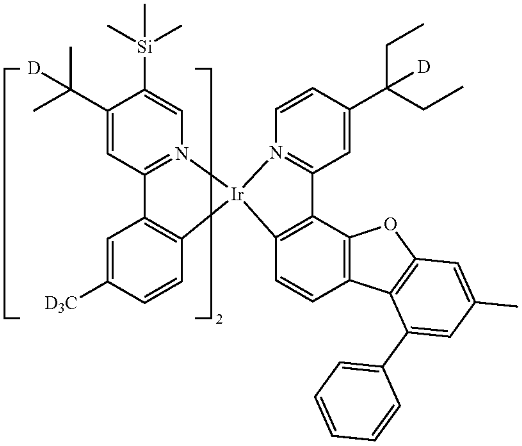

-continued
2573
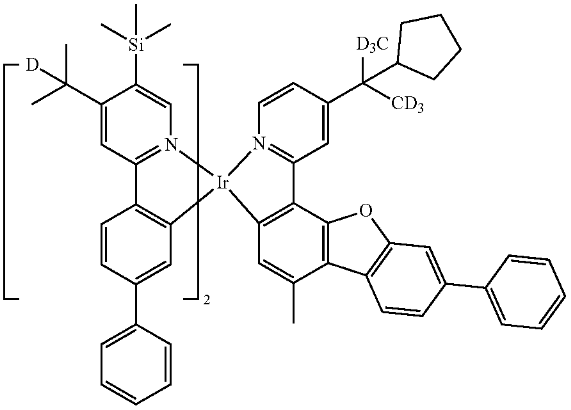
2574
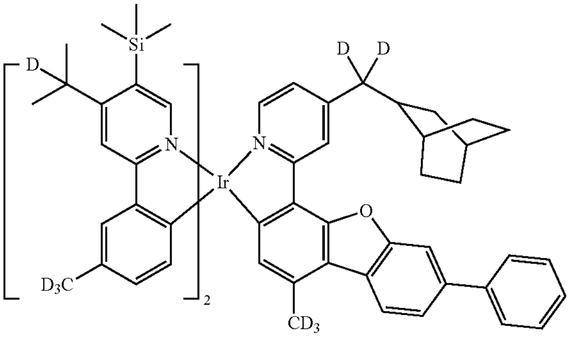
2575
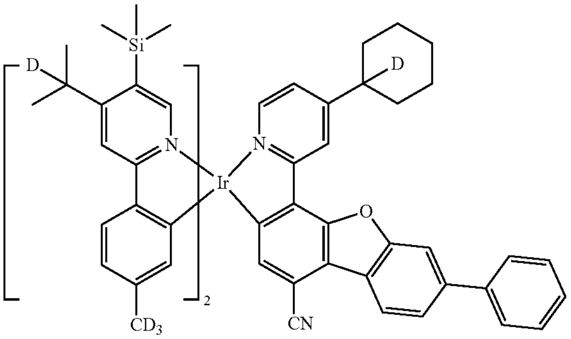
2576
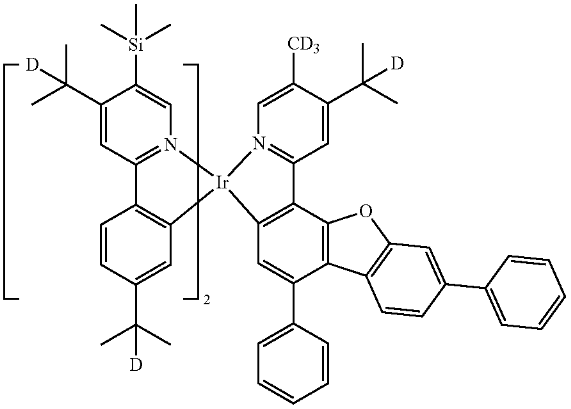
-continued
2577
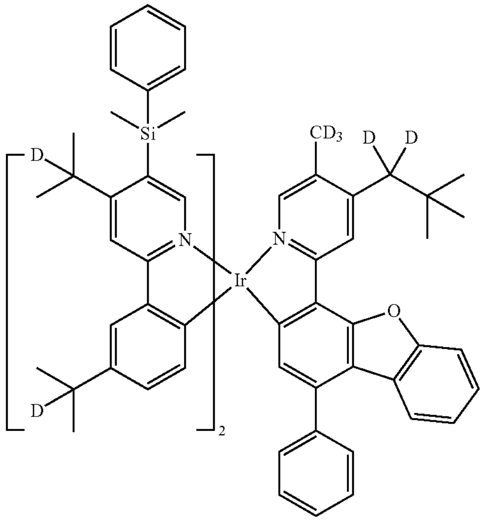
2578
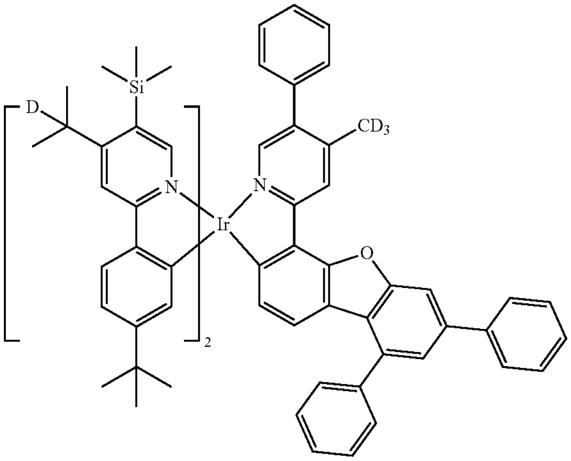
2579
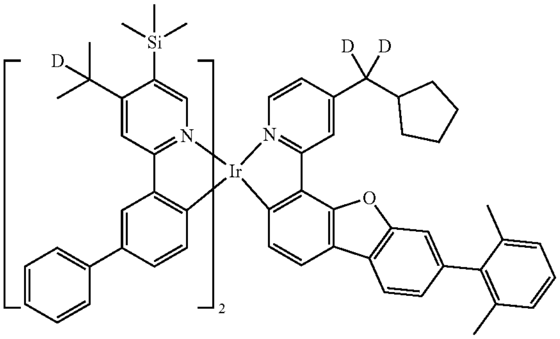

2580
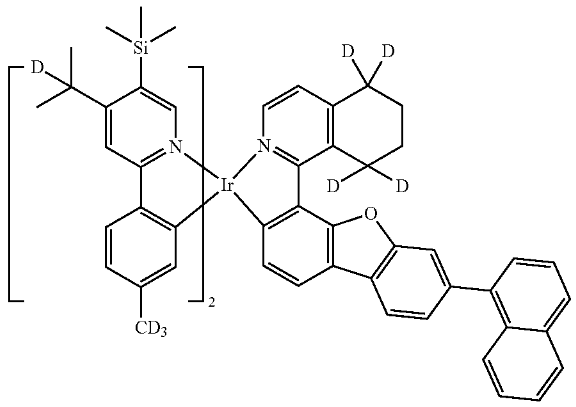
2581
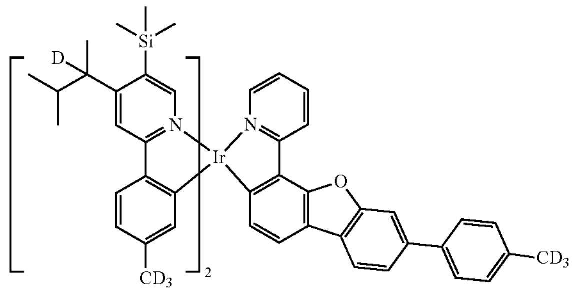
2582
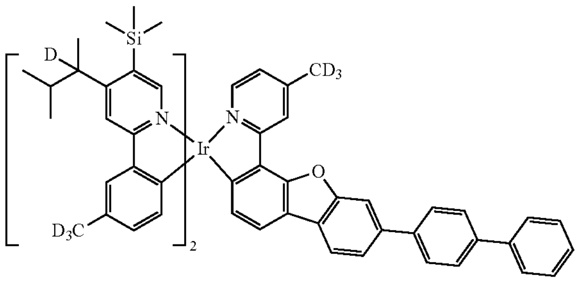
2583
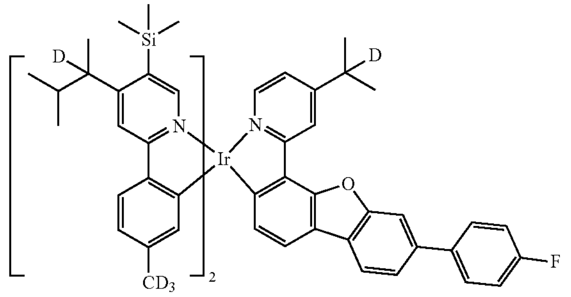
2584
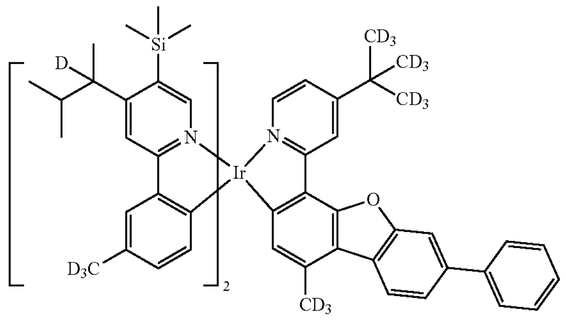
2585
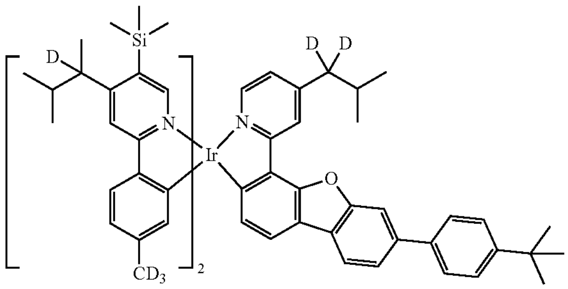
2586
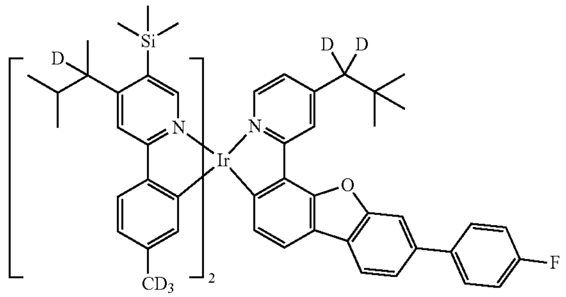
2587
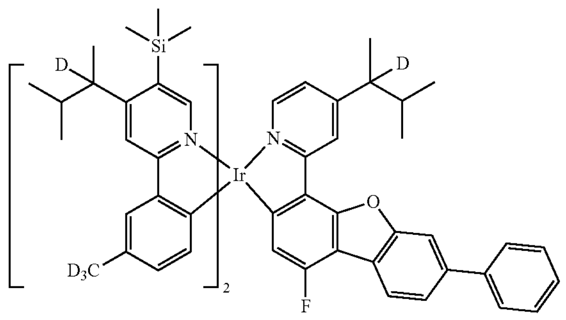

-continued
2588
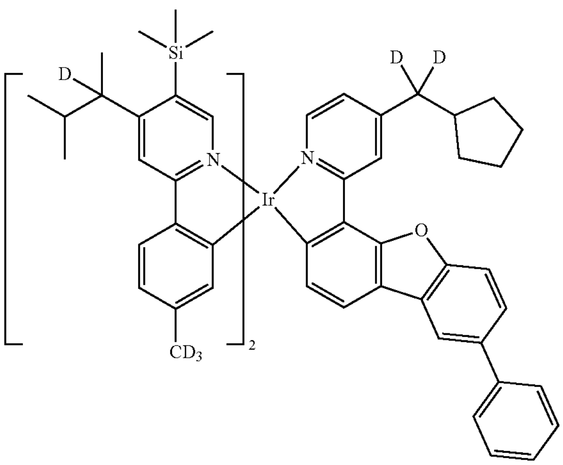
2589
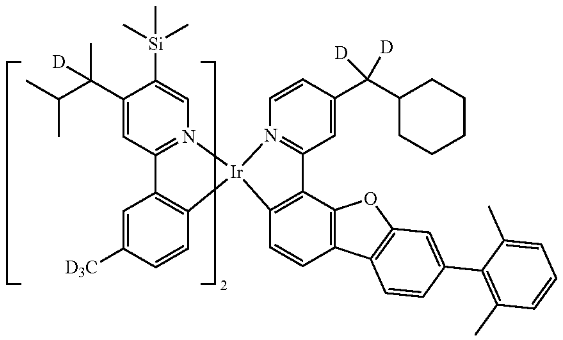
2590
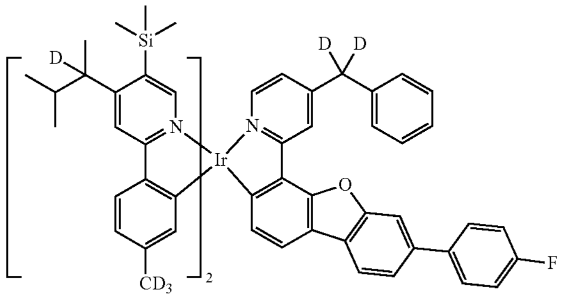
2591
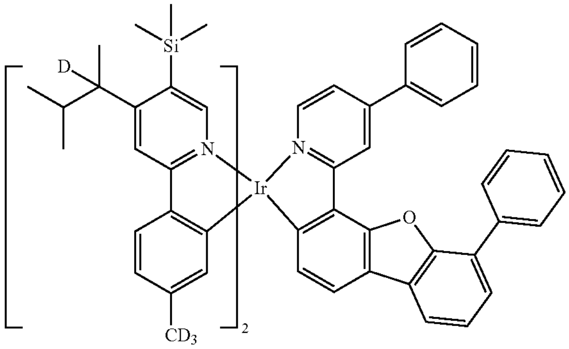
-continued
2592
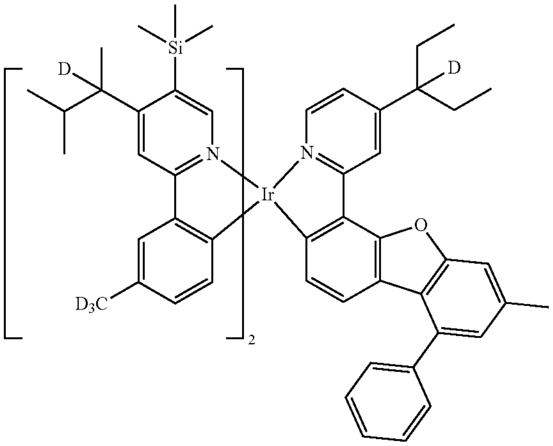
2593
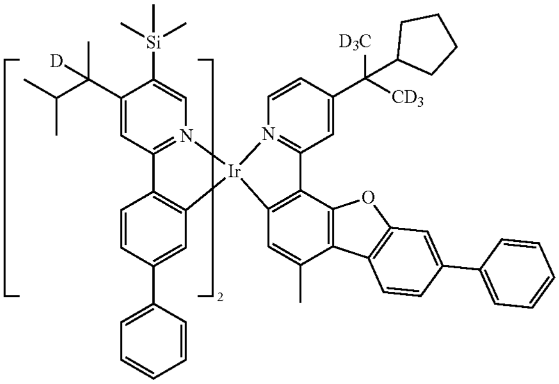
2594
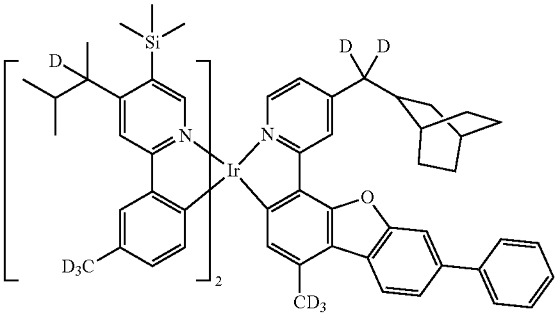
2595
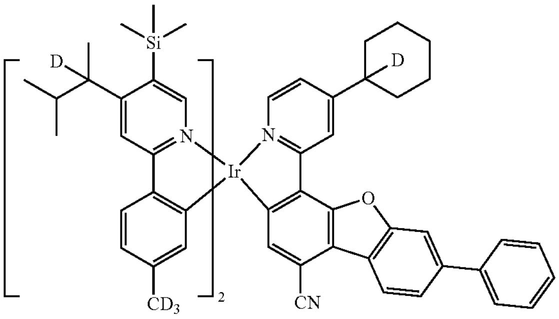

-continued
2596
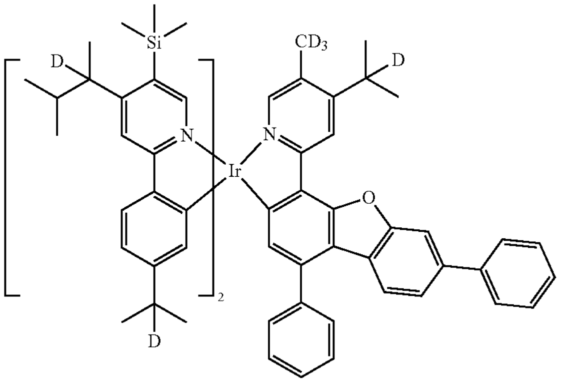
2597
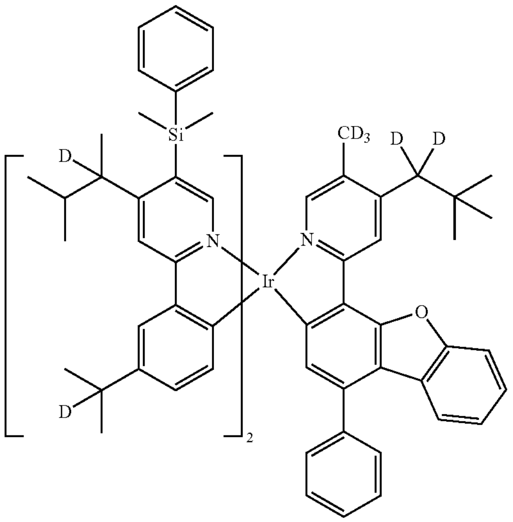
2598
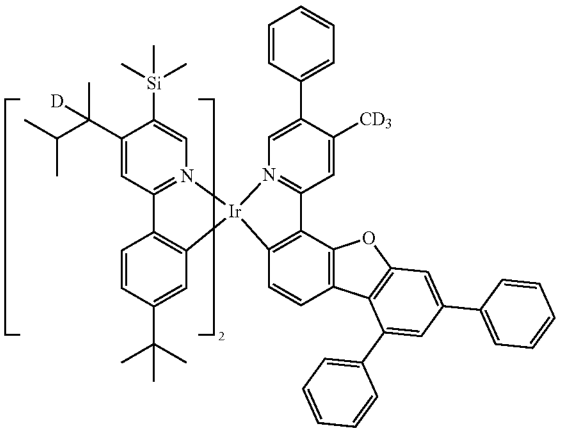
-continued
2599
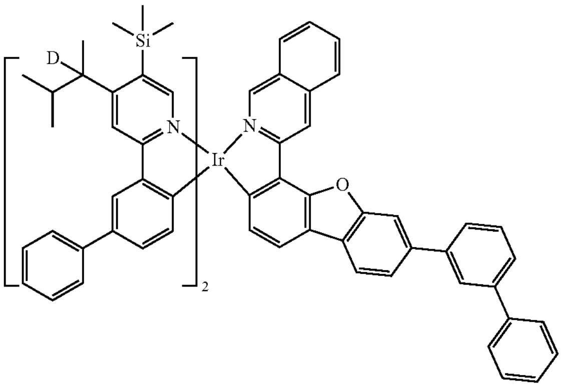
2600
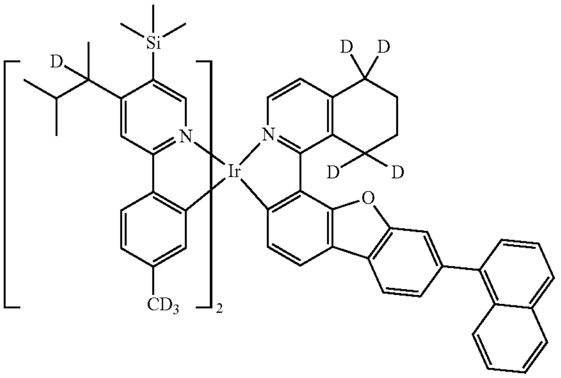
2601
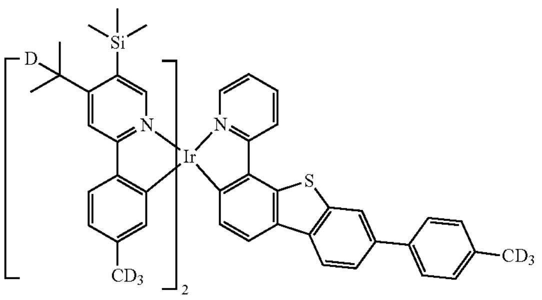
2602
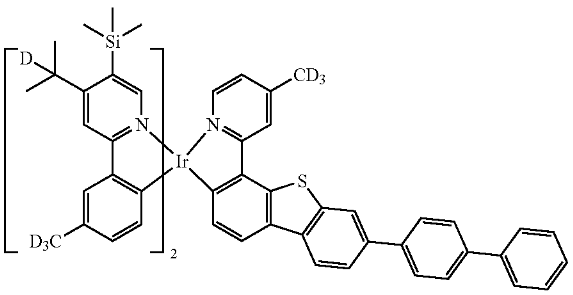

2603
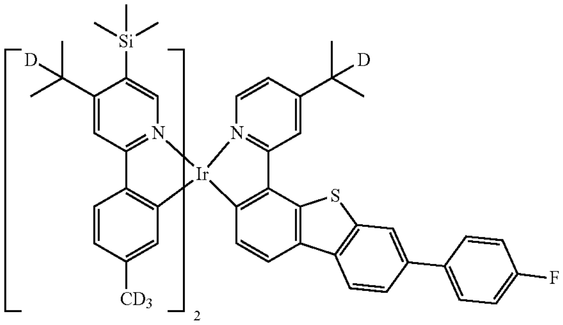
2604
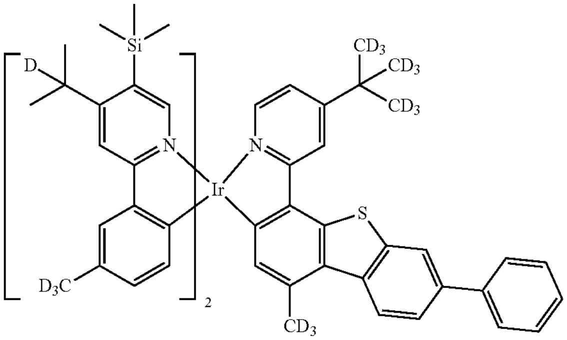
2605
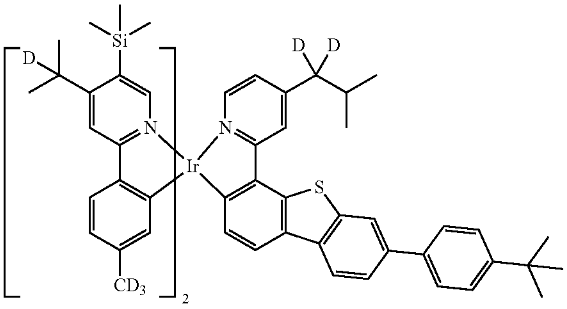
2606
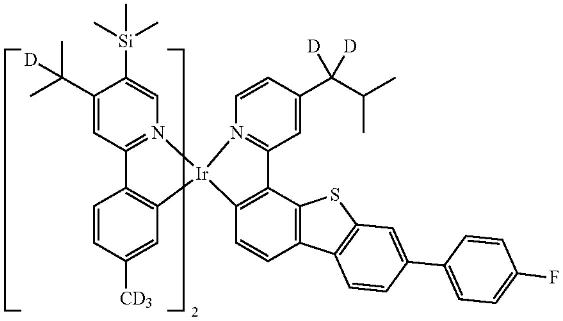
2607
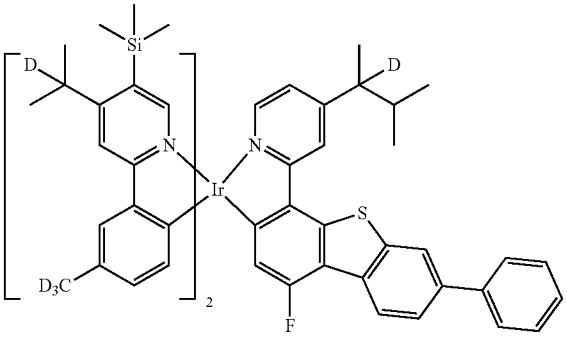
2608
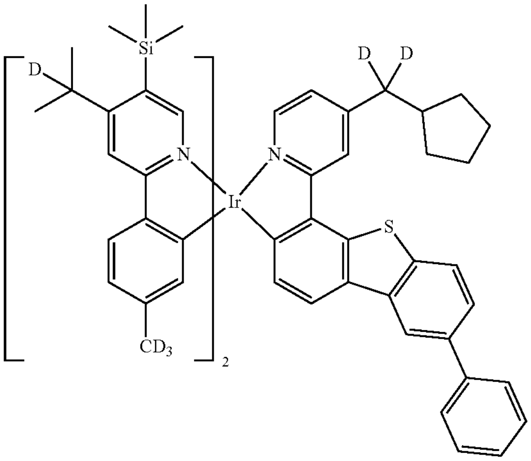
2609
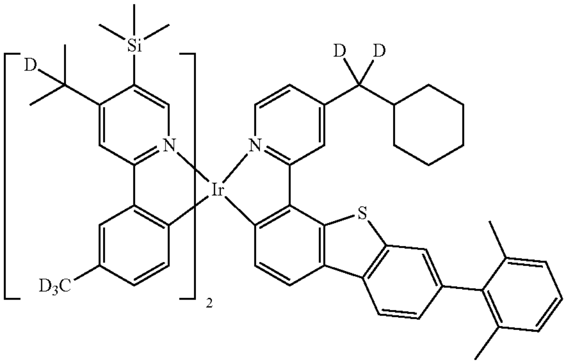
2610
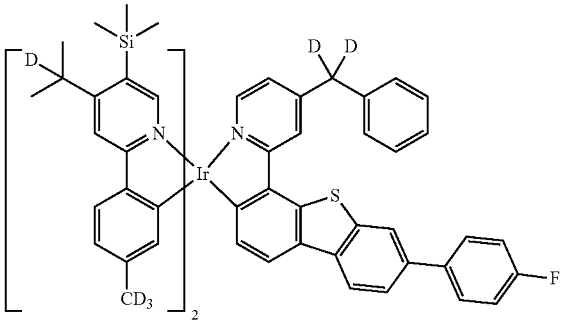

-continued
2611
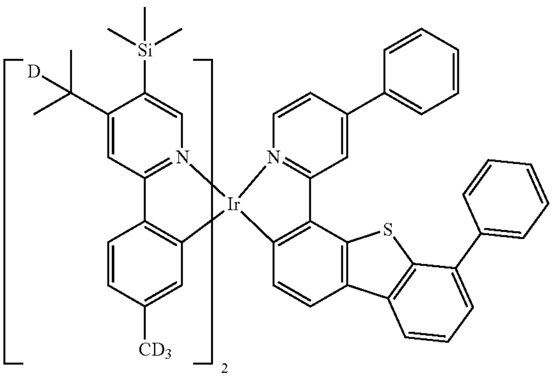
2612
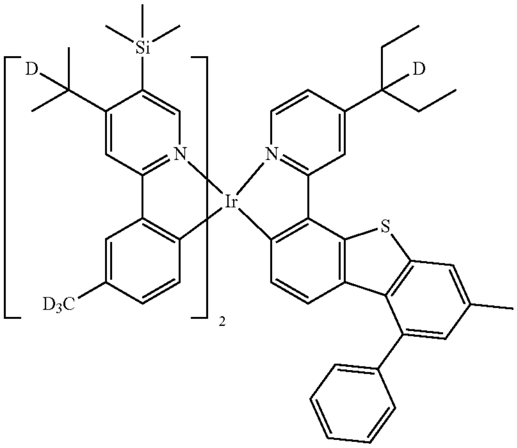
2613
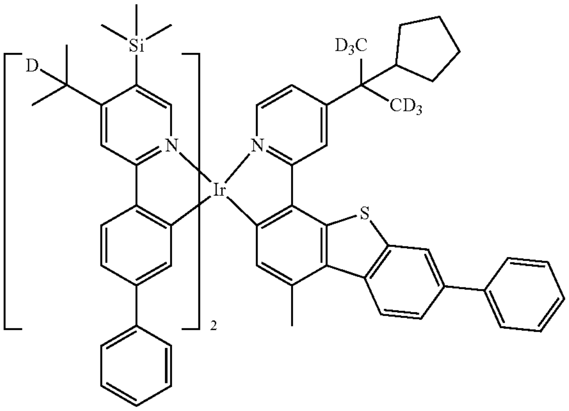
2614
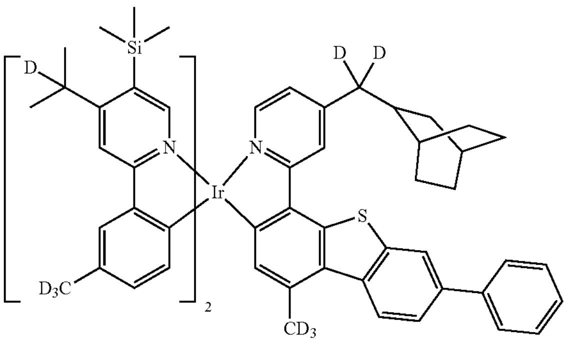
-continued
2615
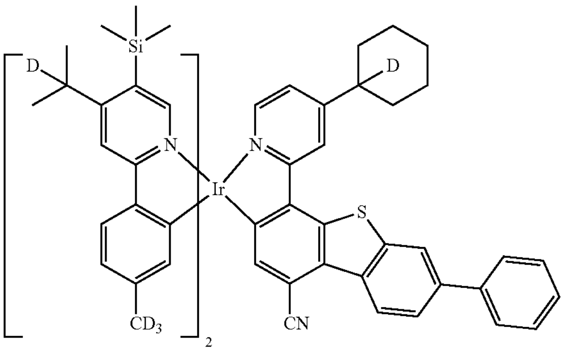
2616
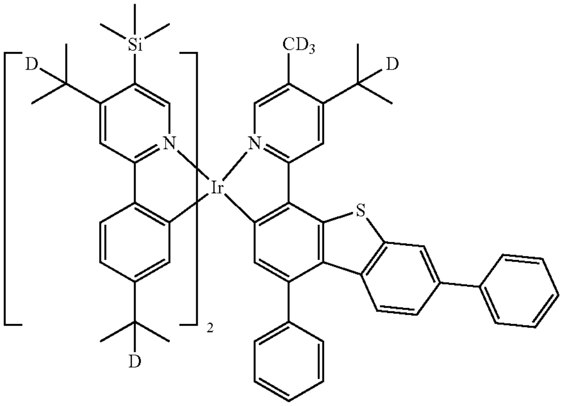
2617
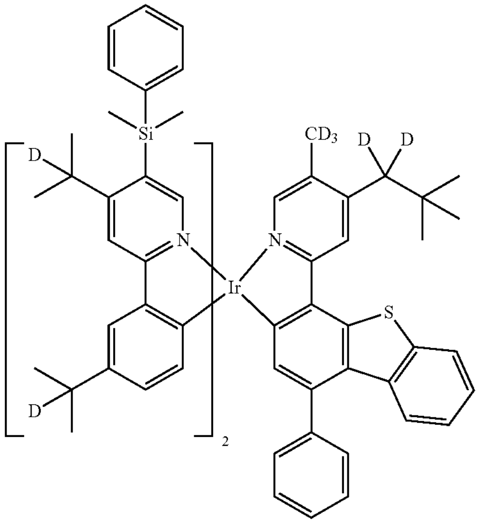

2618
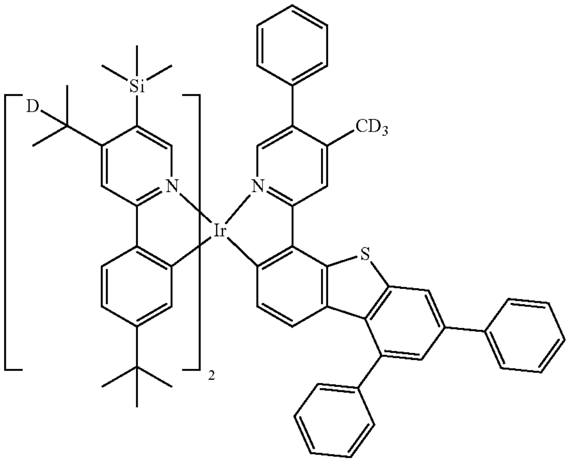
2619
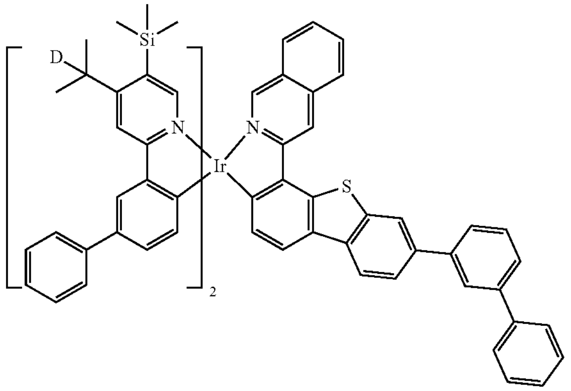
2620
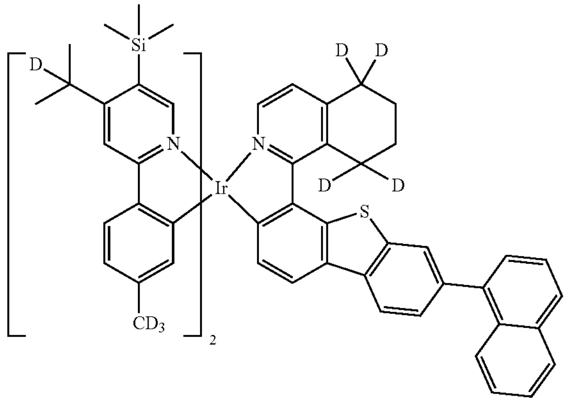
2621
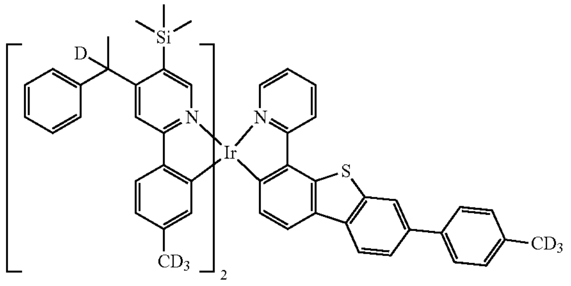
2622
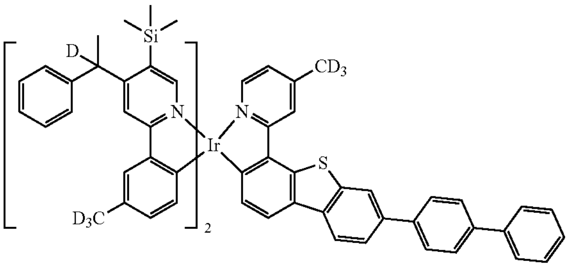
2623
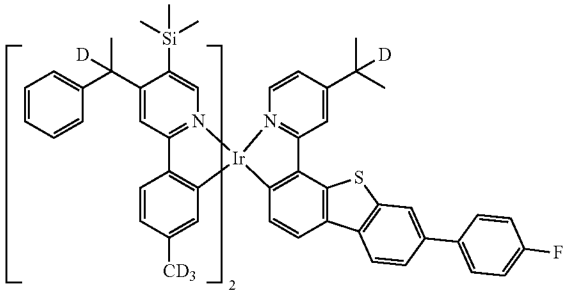
2624
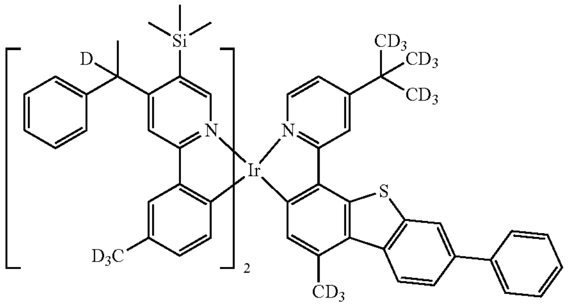
2625
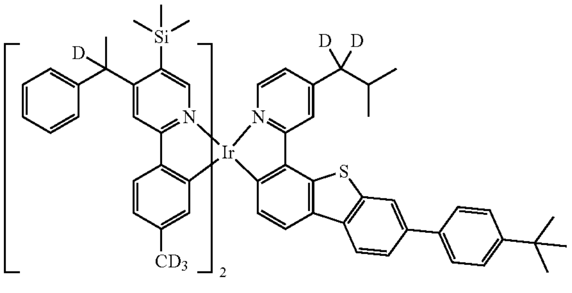
2626
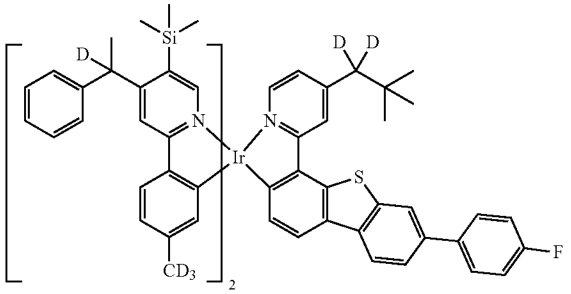

-continued
2627
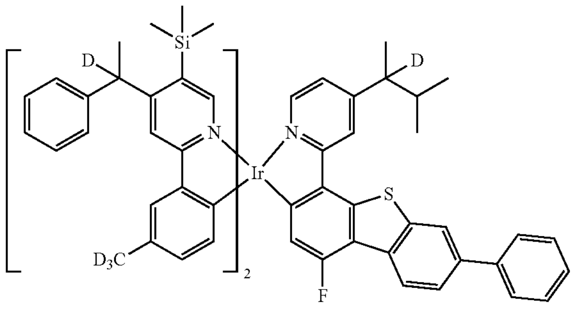
2628
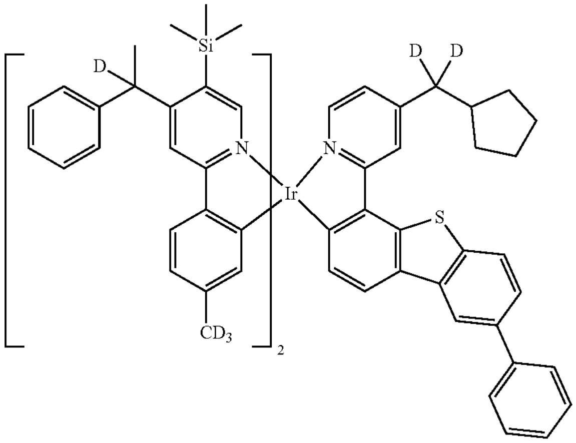
2629
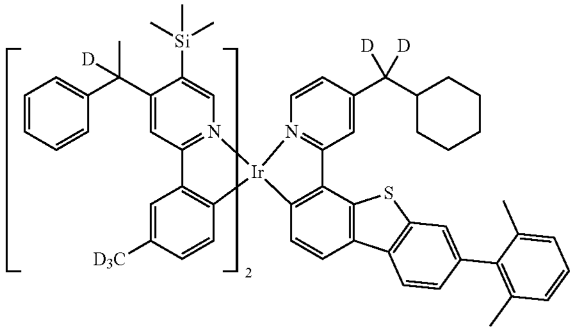
2630
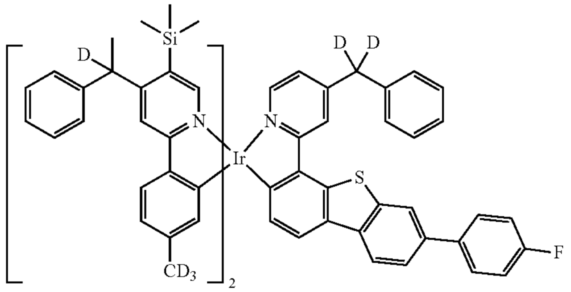
-continued
2631
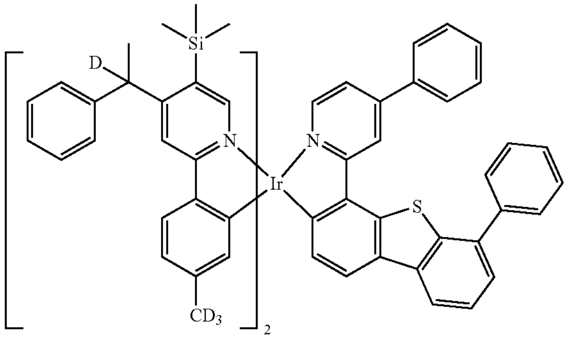
2632
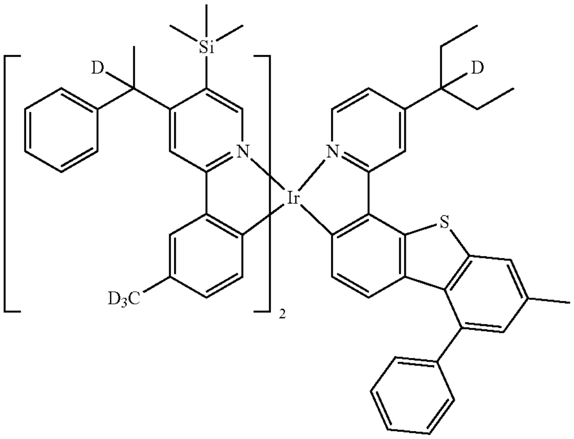
2633
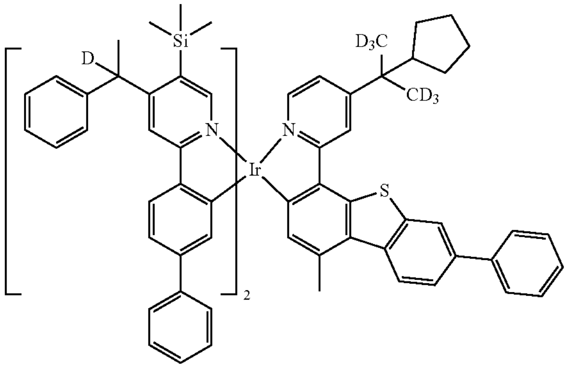
2634
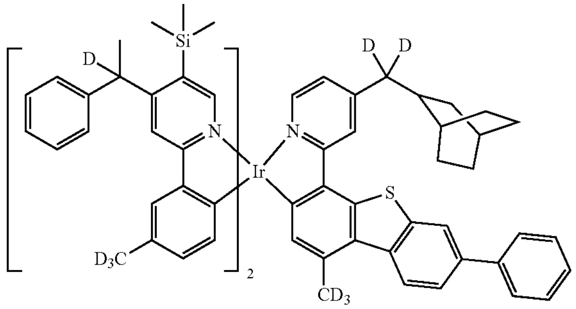

2635
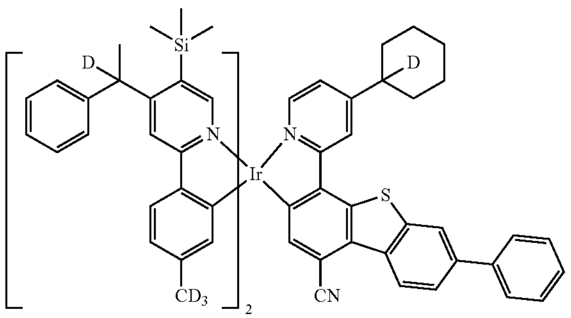
2636
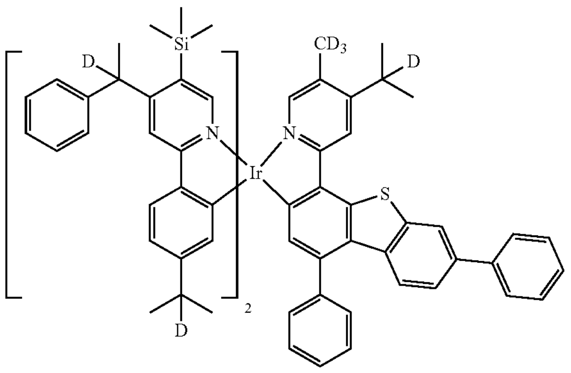
2637
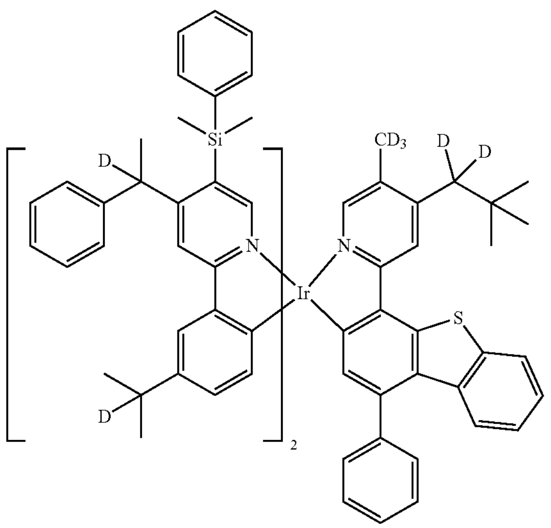
2638
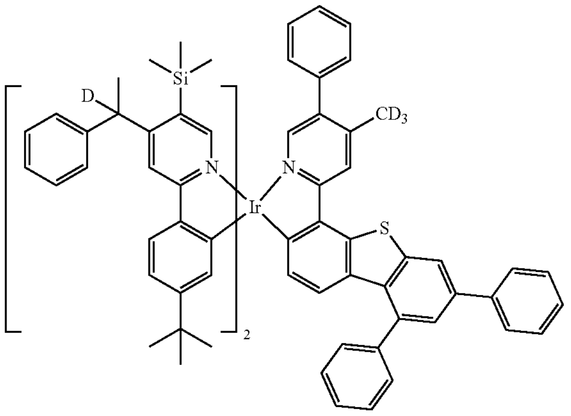
2639
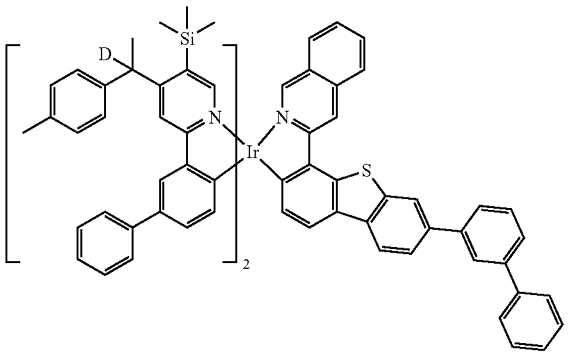
2640
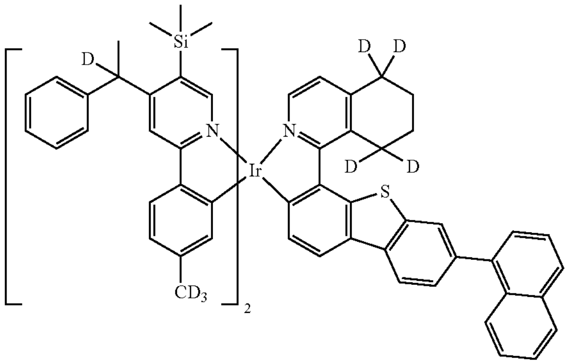

-continued
2641
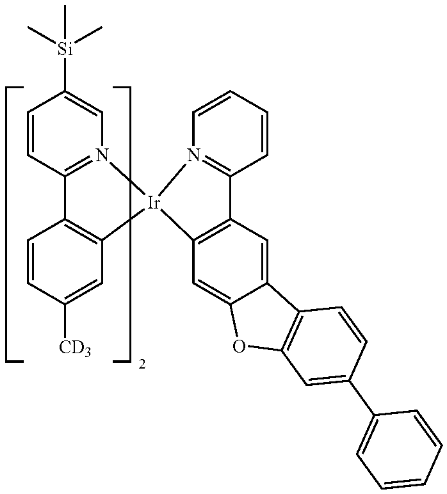
2642
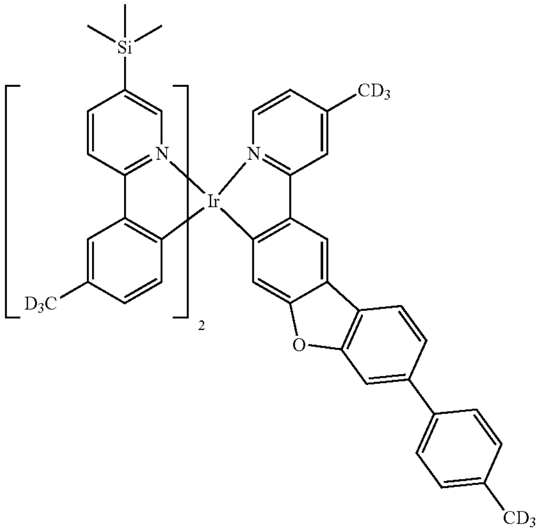
2643
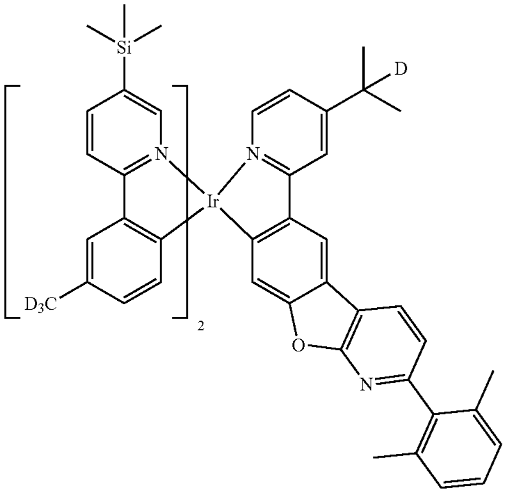
-continued
2644
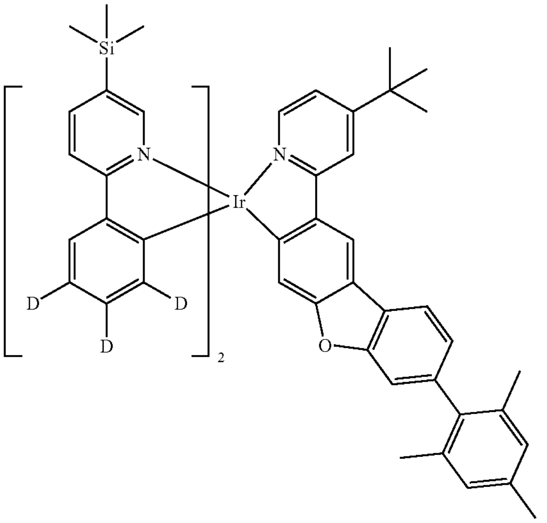
2645
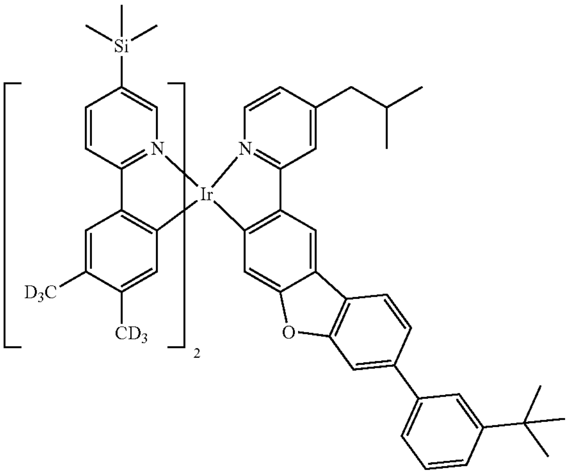
2646
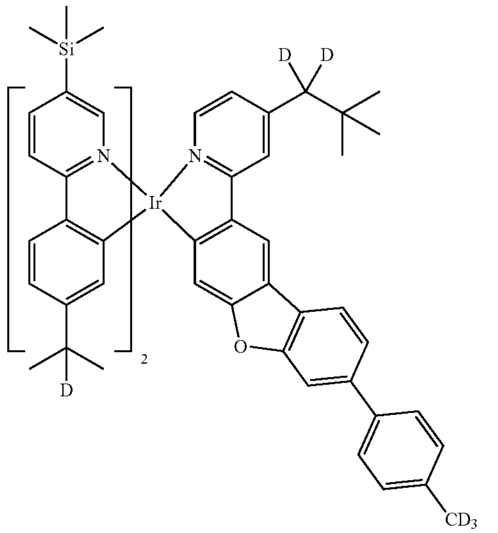

-continued
2647
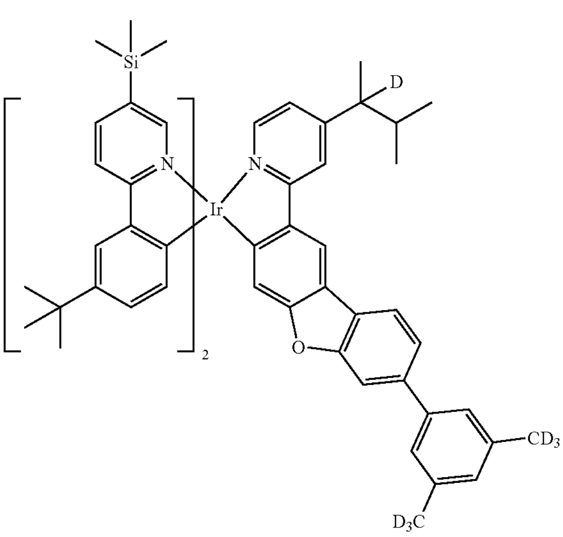
2648
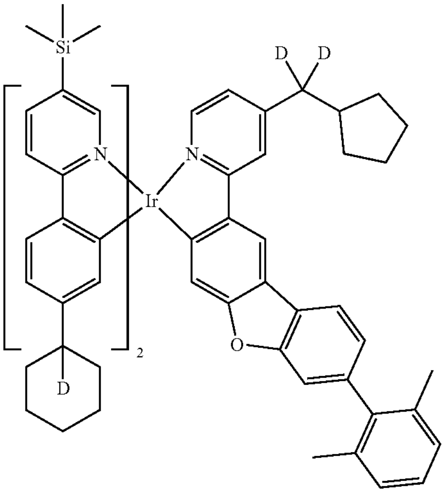
2649
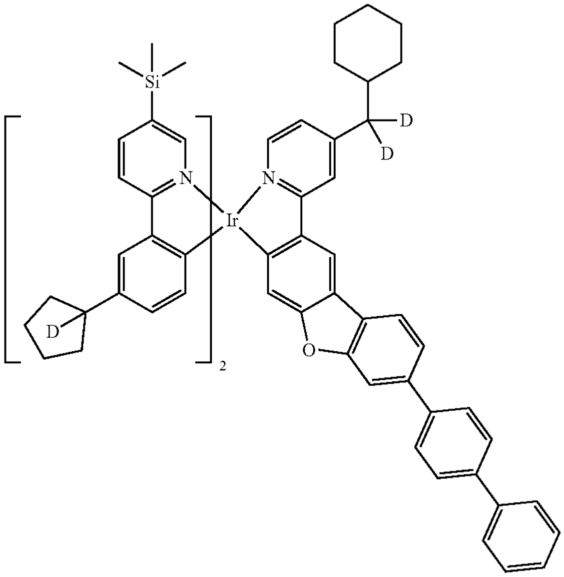
-continued
2650
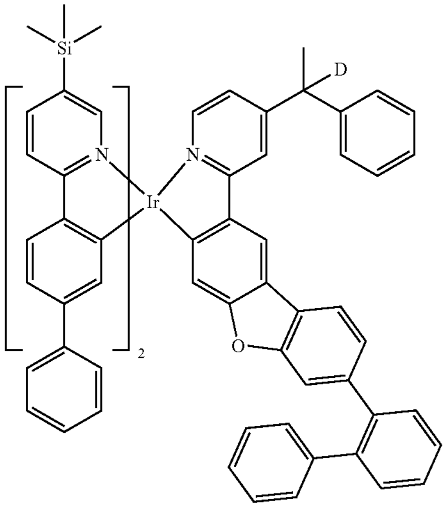
2651
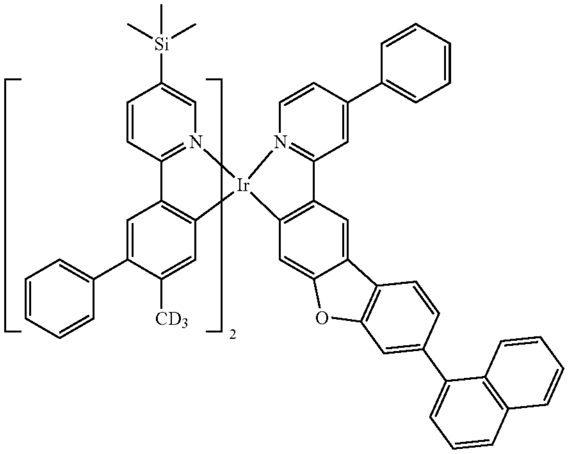
2652
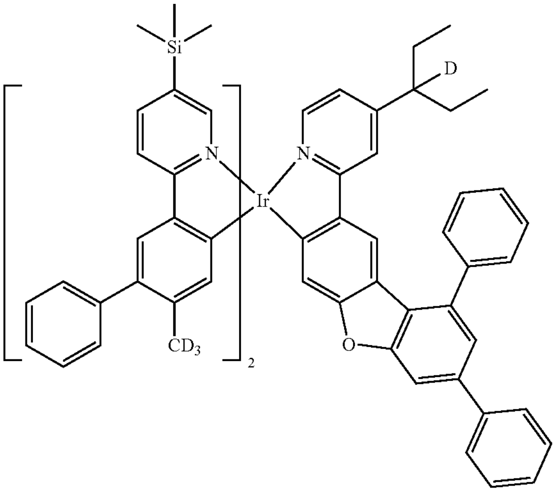

-continued
2653
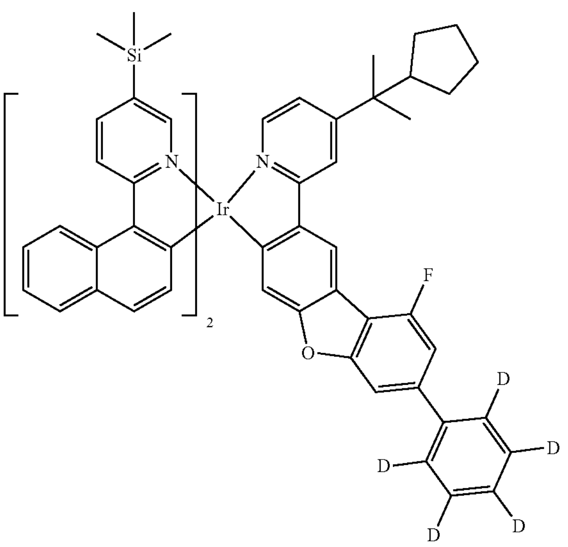
2654
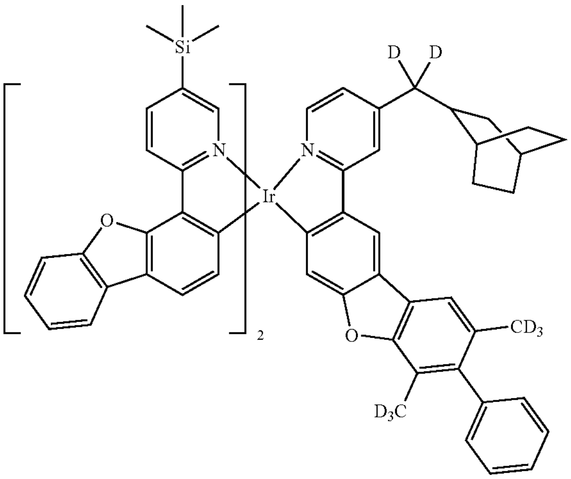
2655
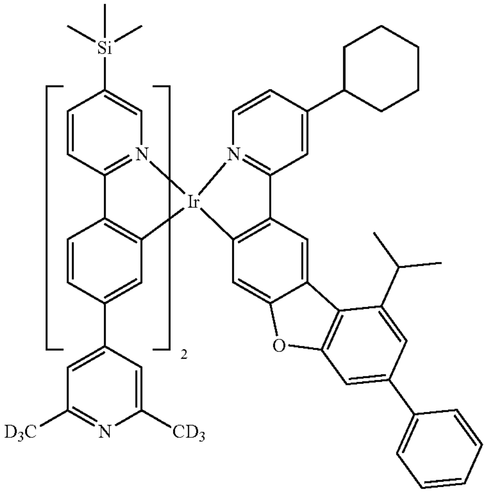
-continued
2656
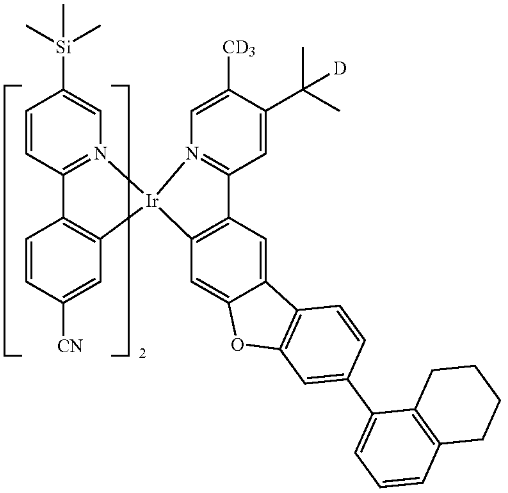
2657
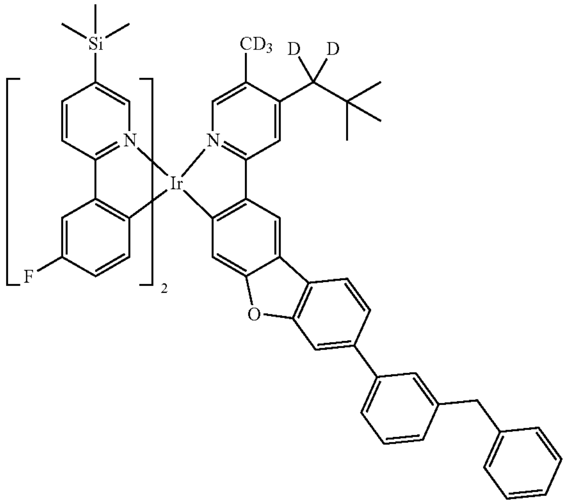
2658
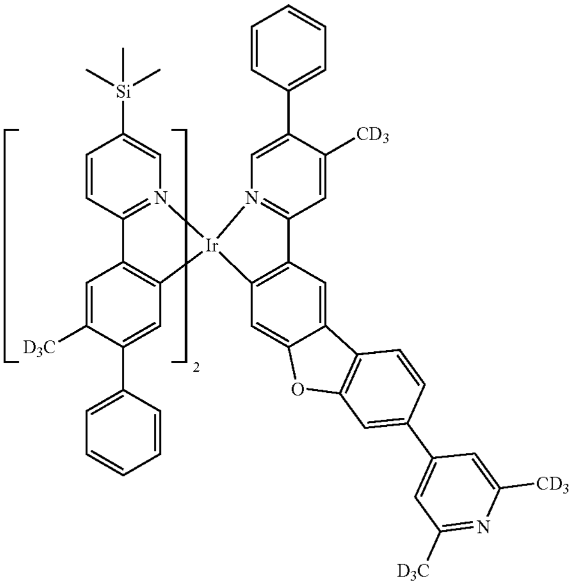

-continued
2659
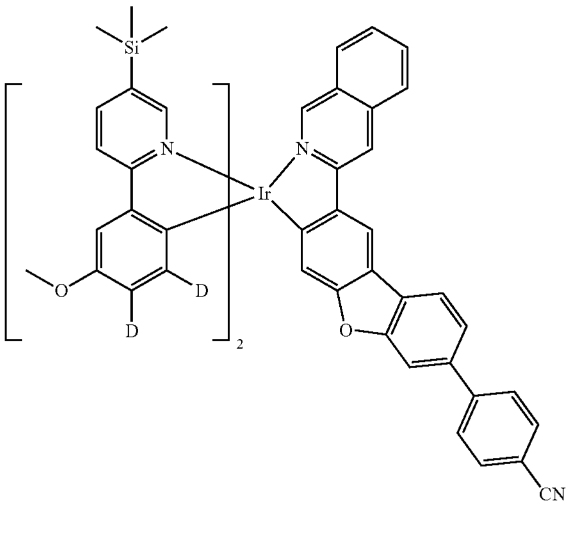
2660
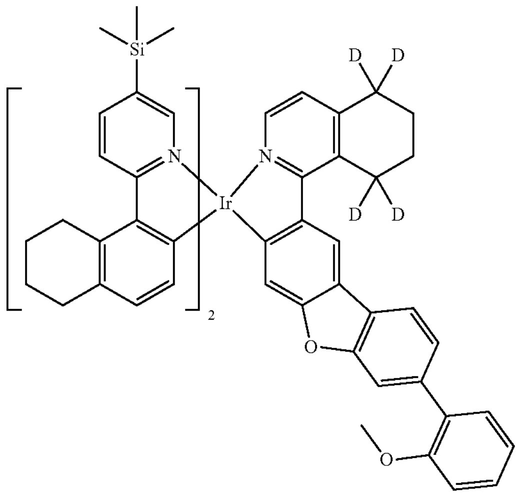
2661
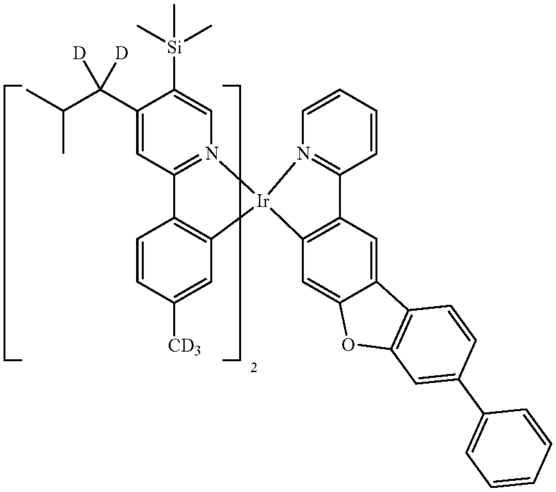
-continued
2662
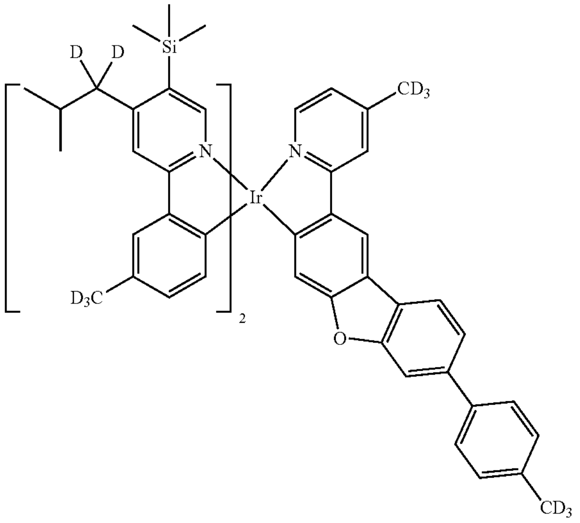
2663
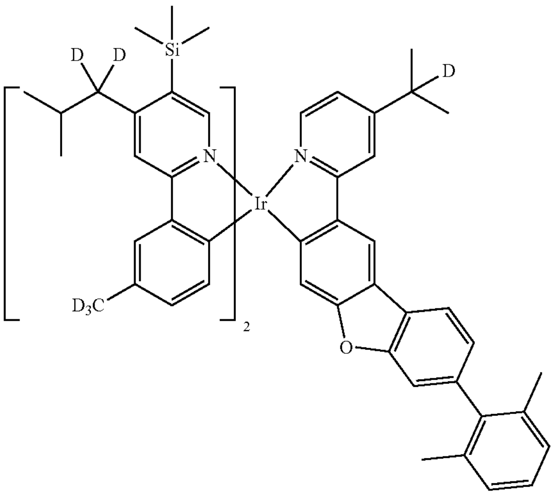
2664
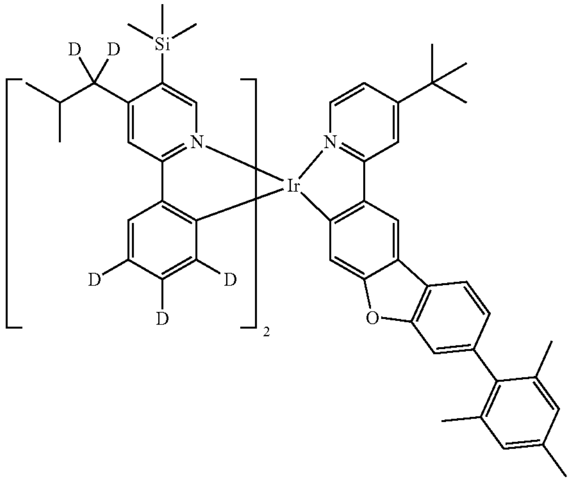

-continued
2665
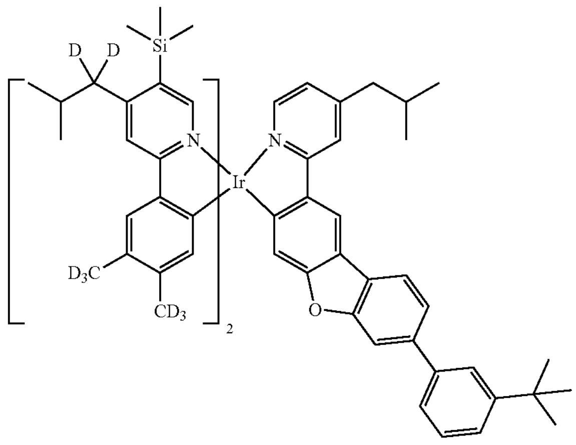
2666
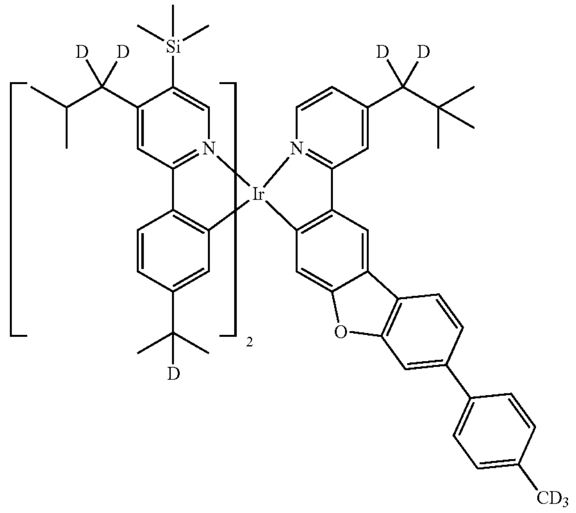
2667
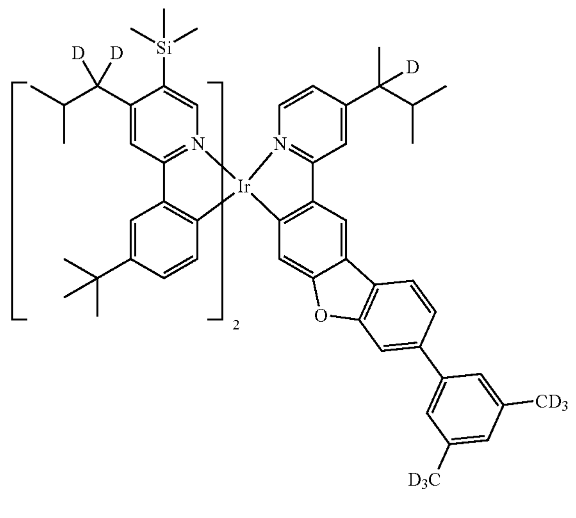
-continued
2668
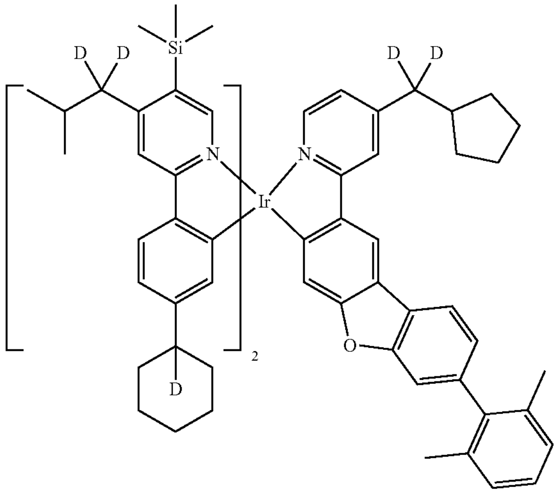
2669
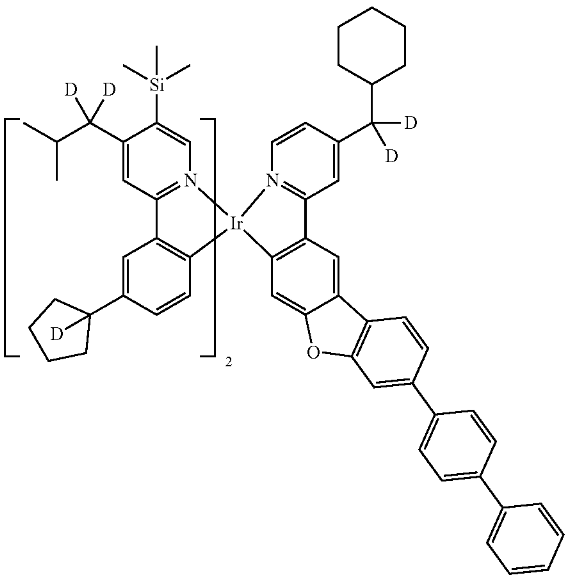
2670
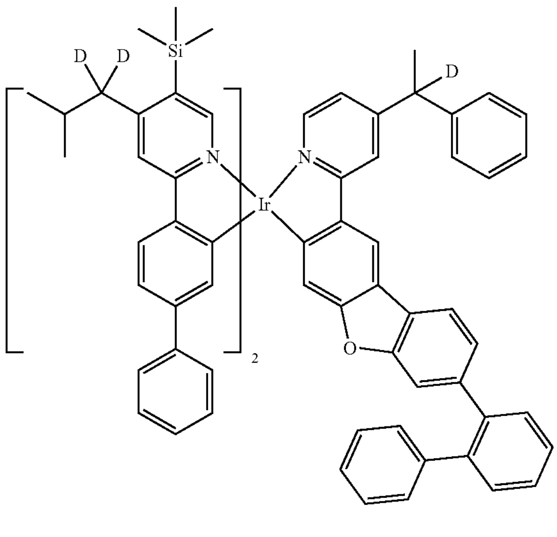

-continued
2671
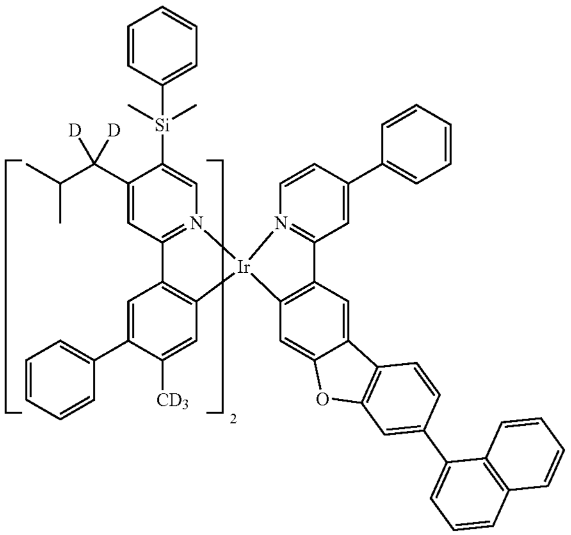
2672
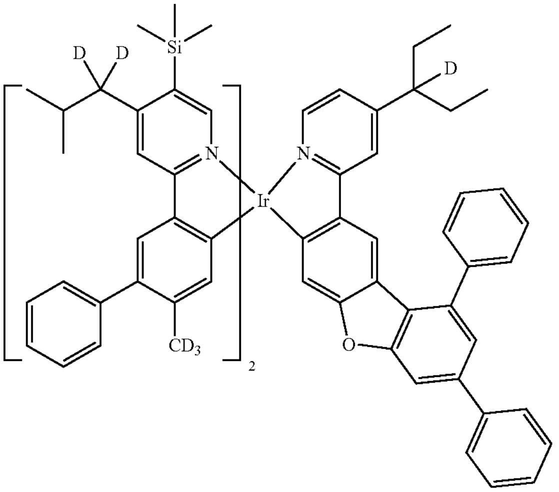
2673
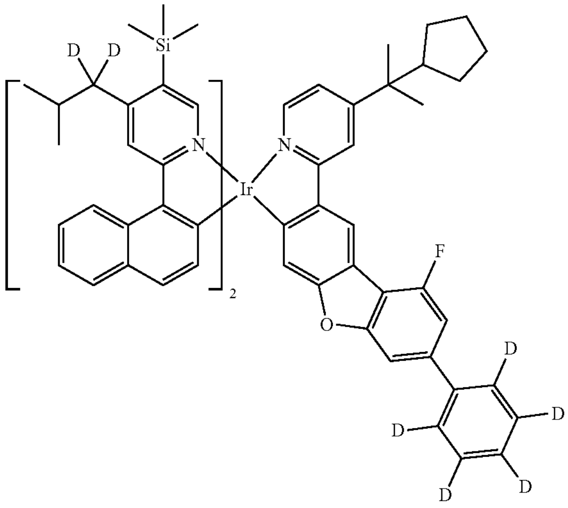
-continued
2674
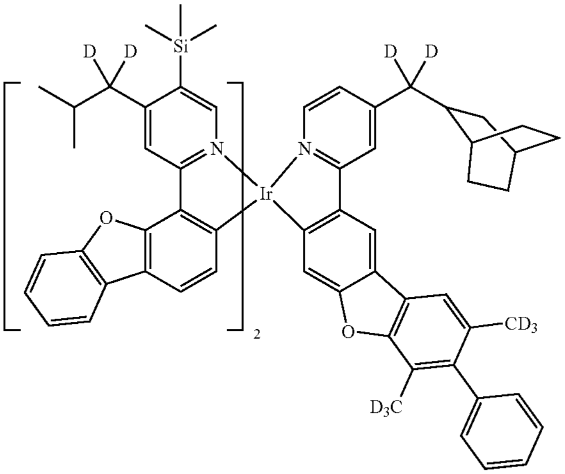
2675
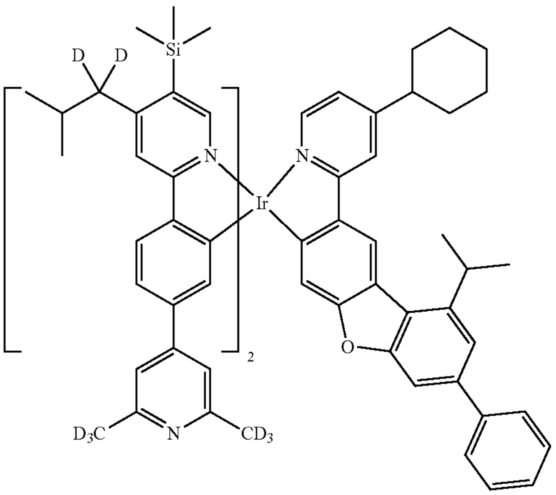
2676
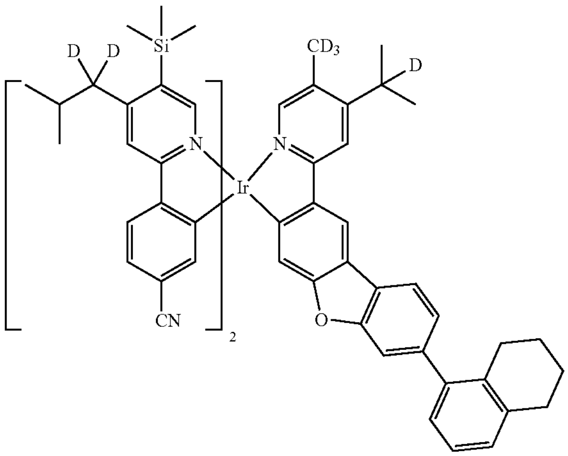

-continued
2677
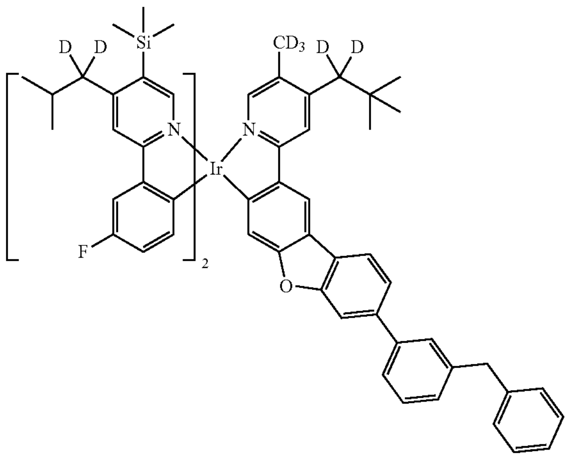
2678
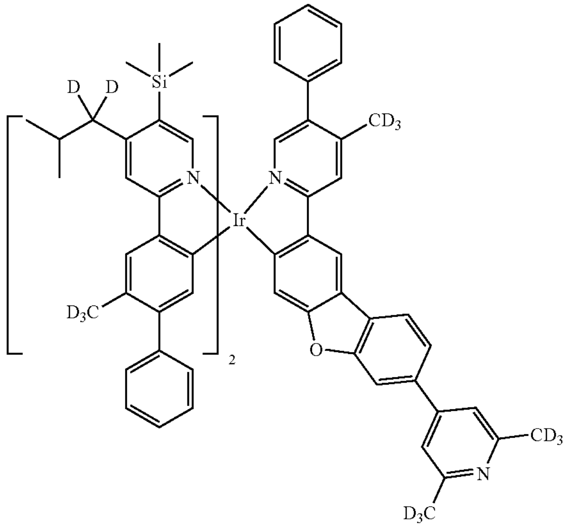
2679
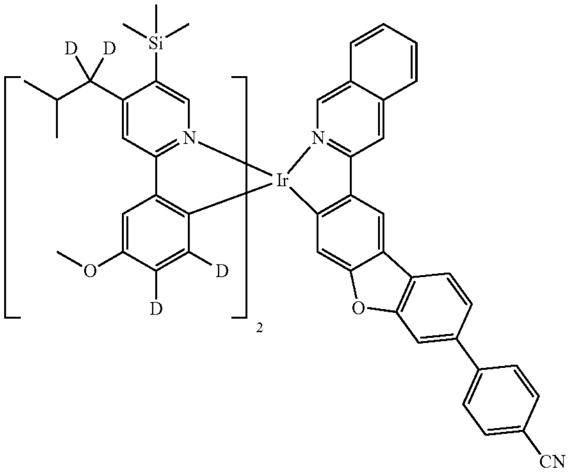
-continued
2680
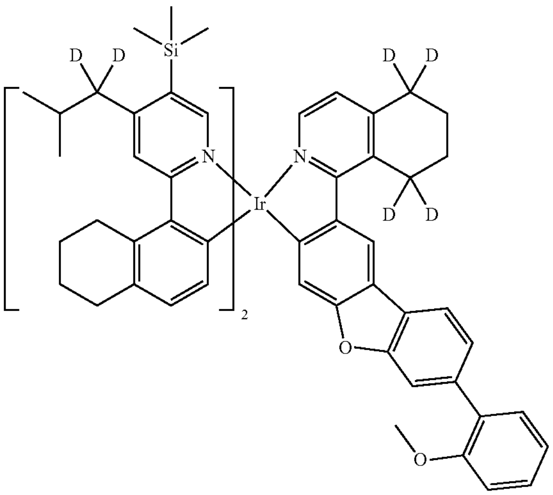
2681
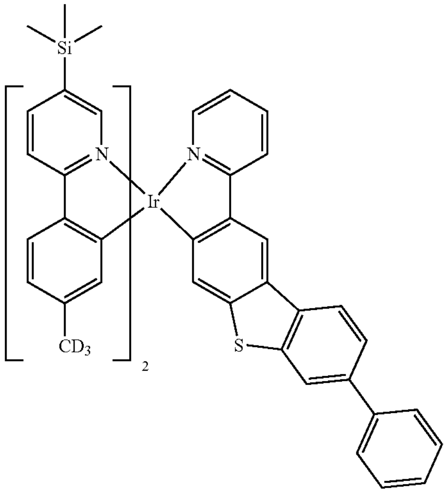
2682
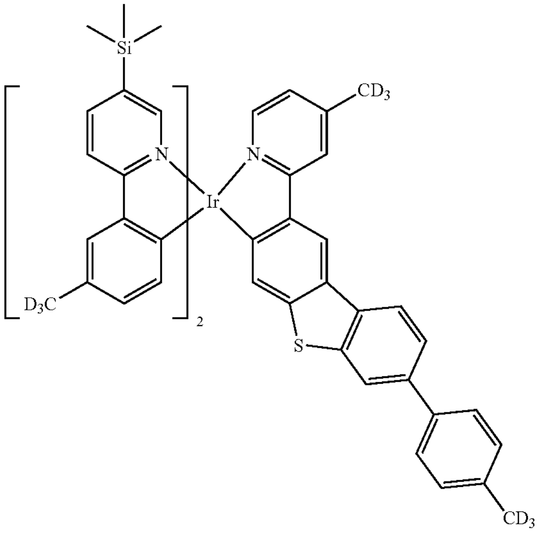

-continued
2683
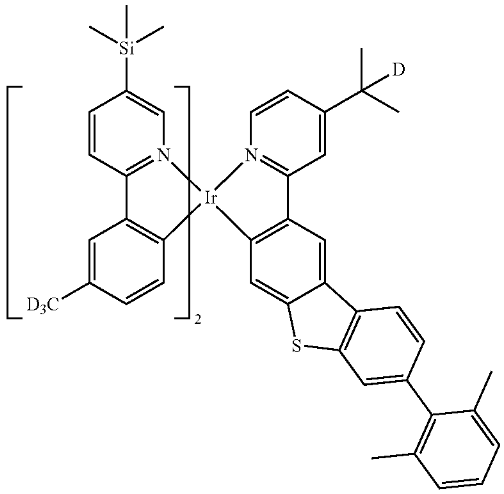
2684
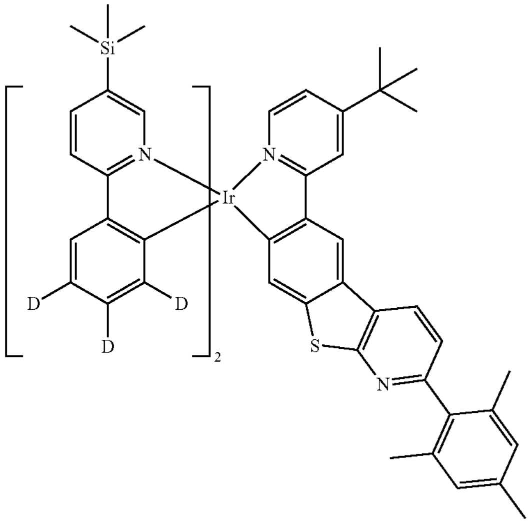
2685
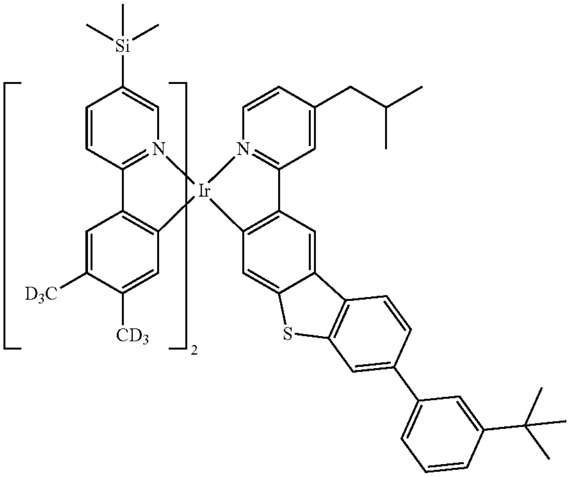
2686
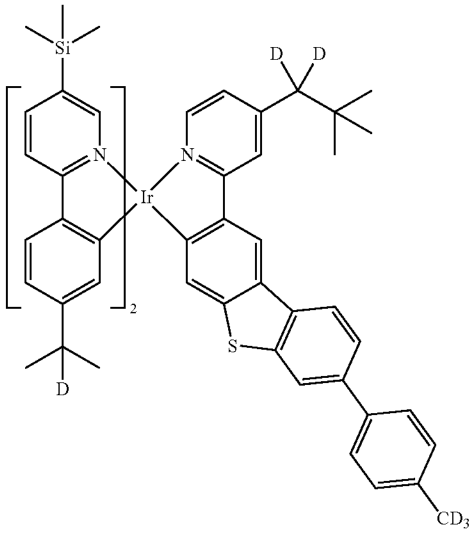
2687
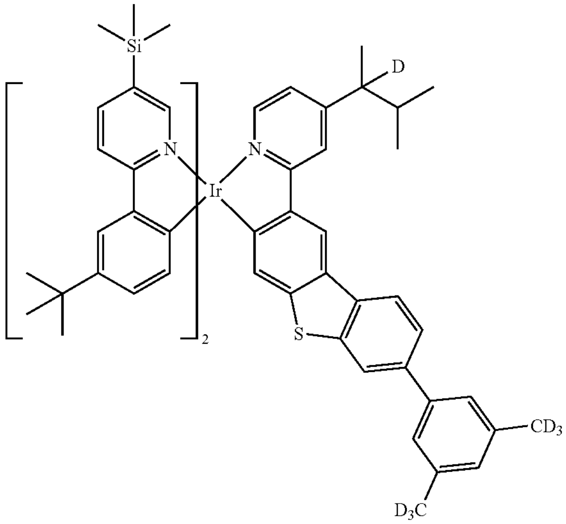
2688
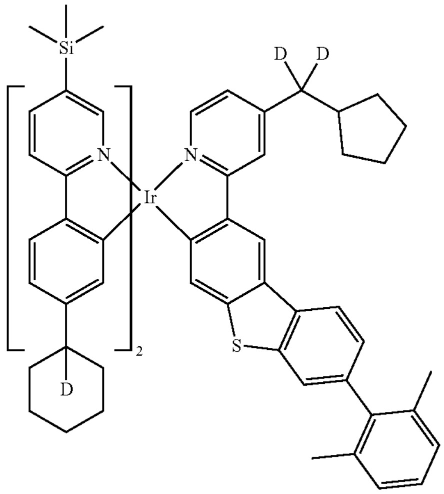

-continued
2689
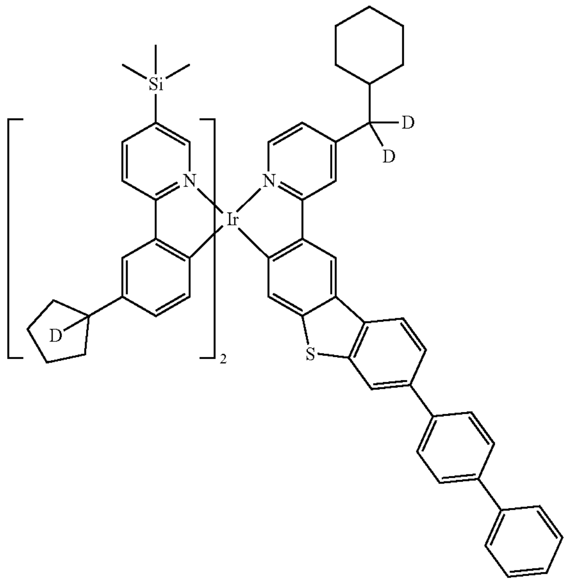
2690
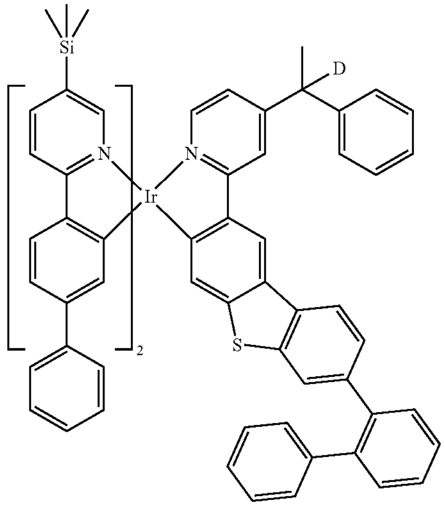
2691
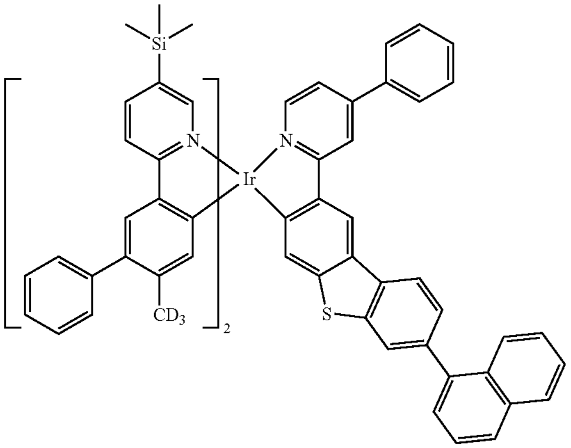
2692
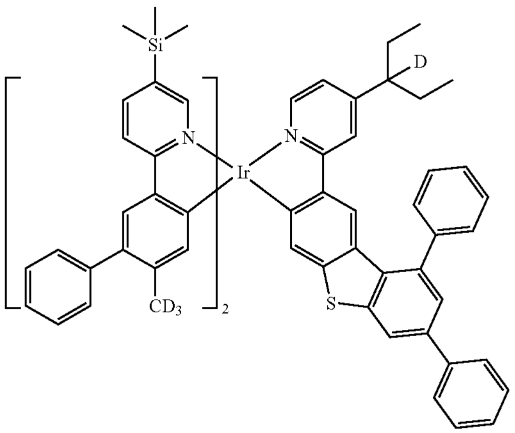
2693
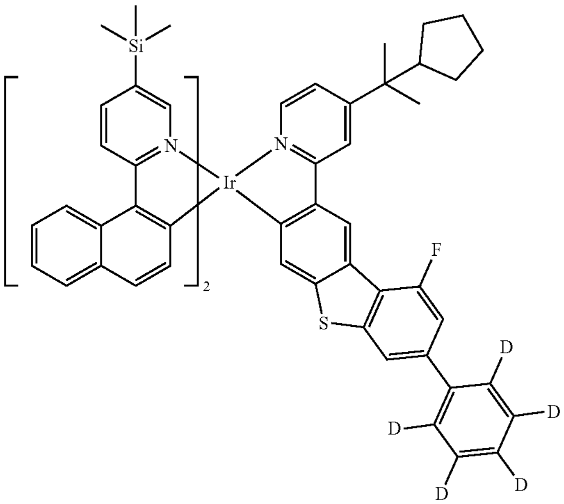
2694
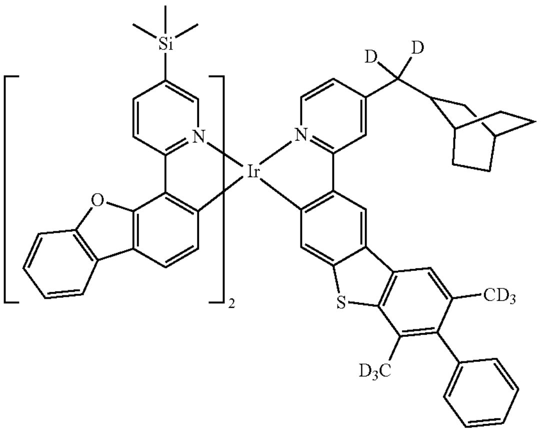

2695
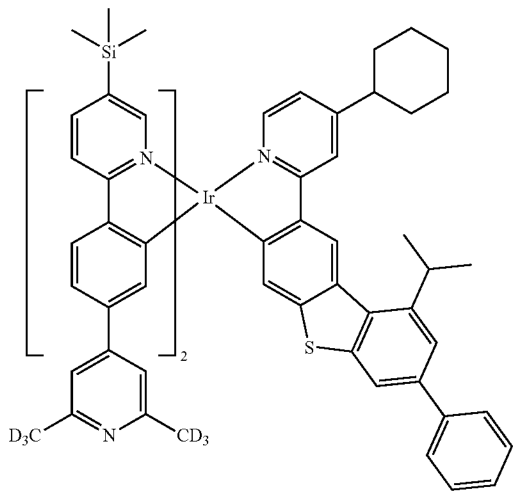
2696
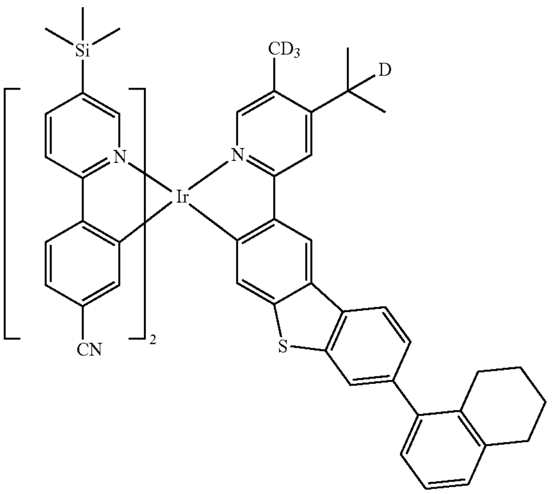
2697
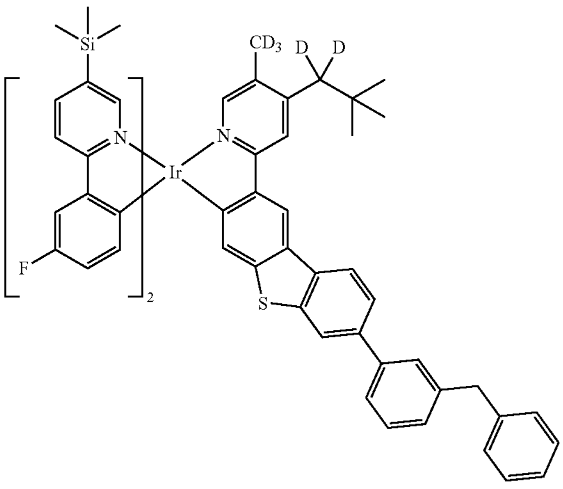
2698
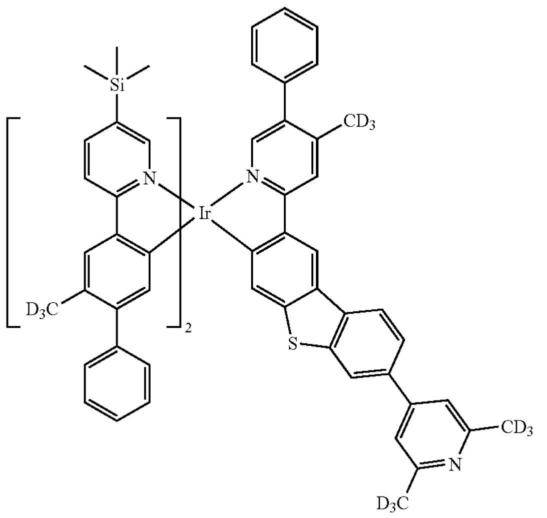
2699
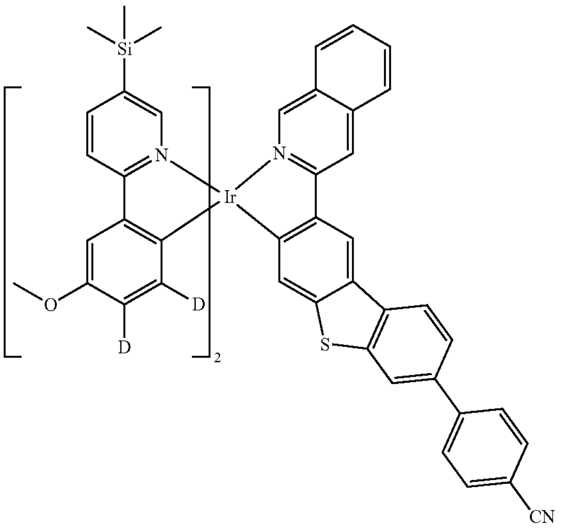
2700
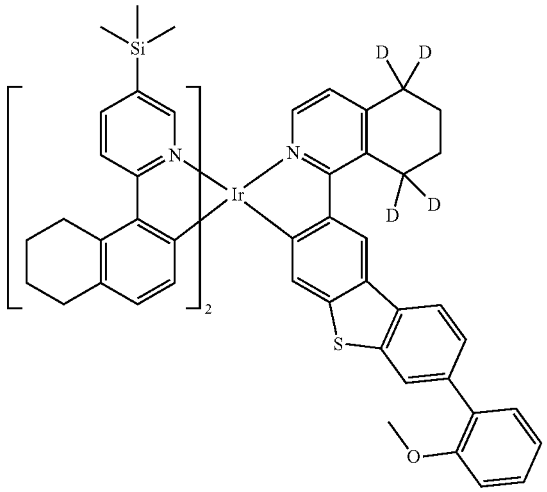

2701
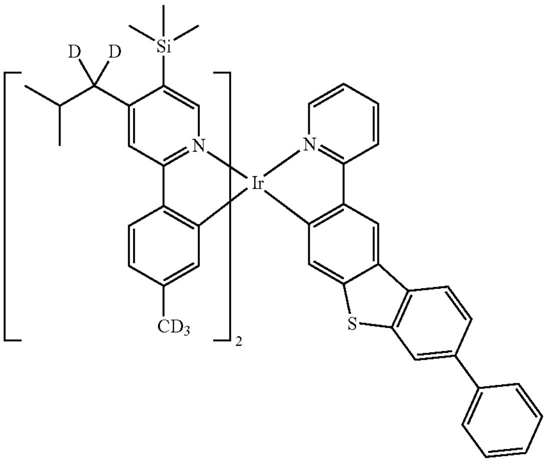
2702
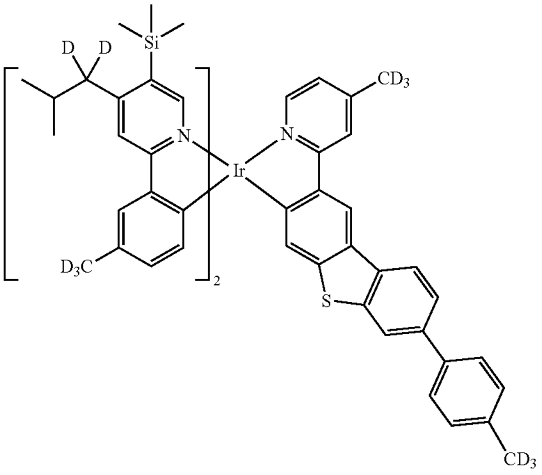
2703
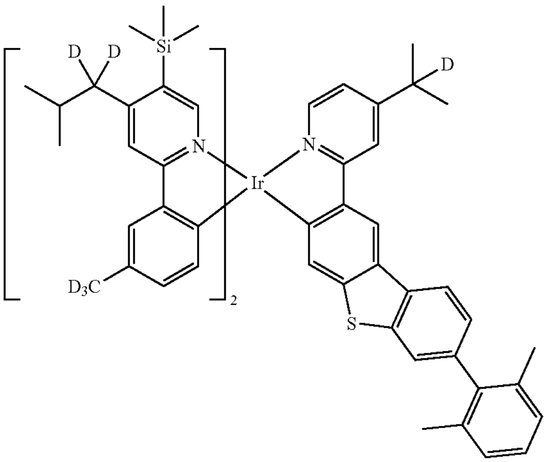
2704
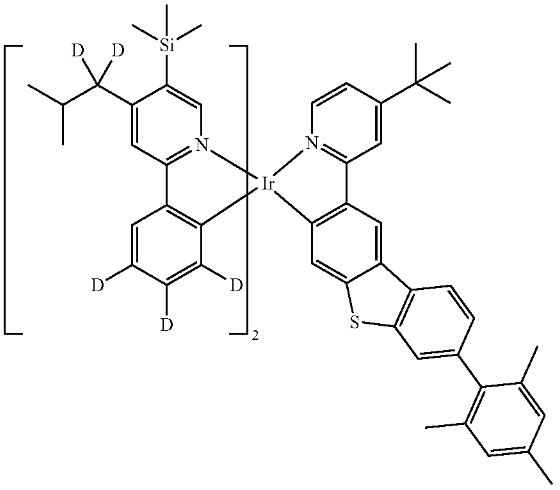
2705
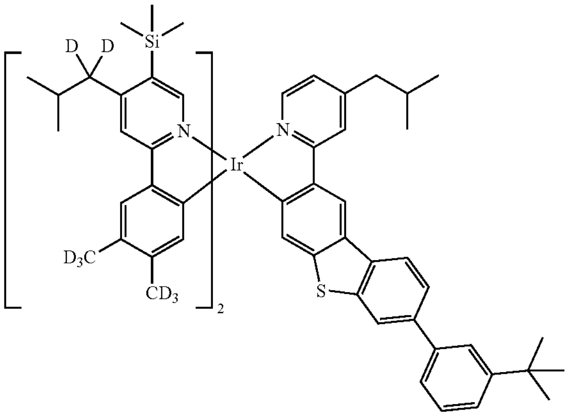
2706
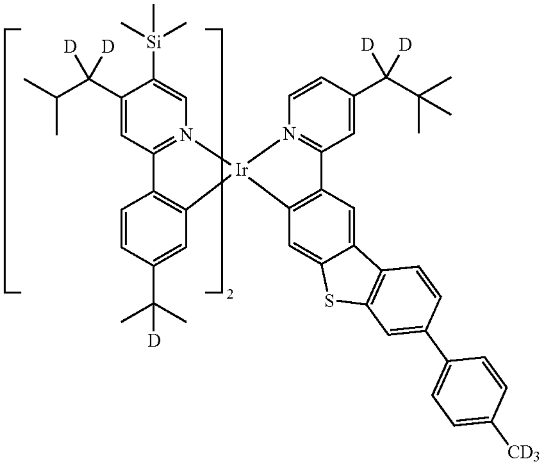

-continued
2707
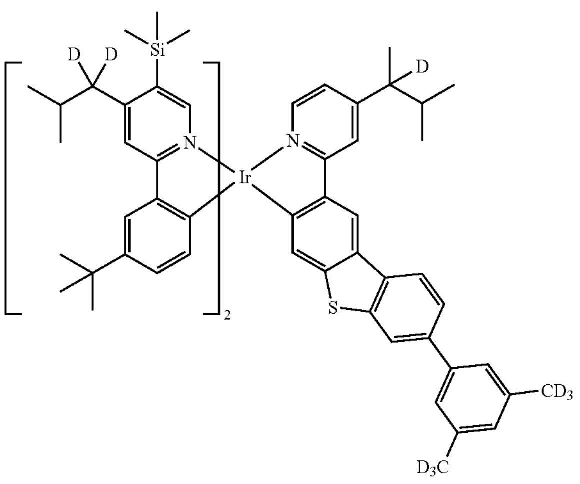
2708
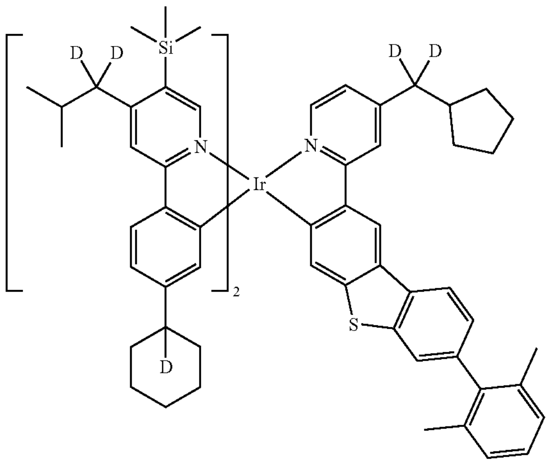
2709
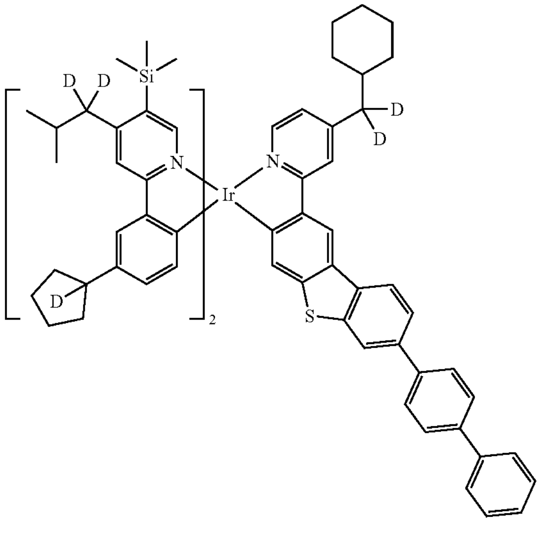
-continued
2710
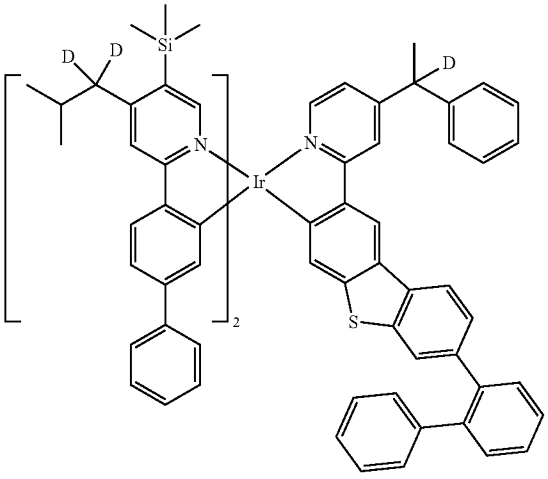
2711
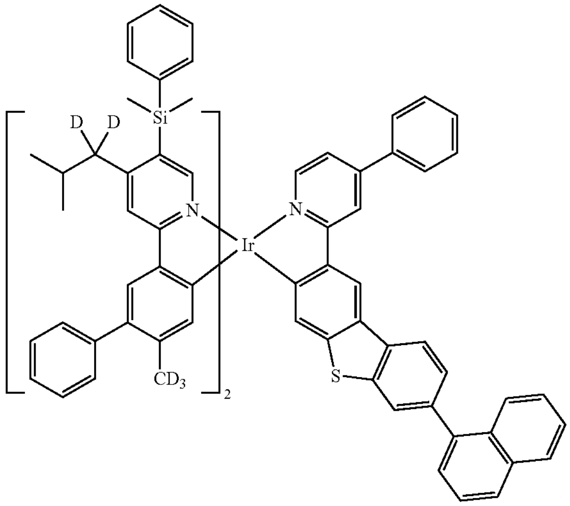
2712
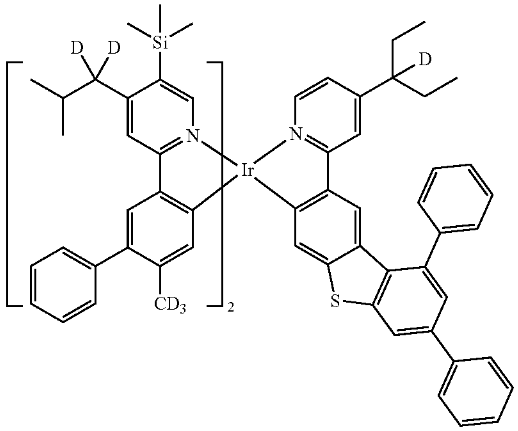

-continued
2713
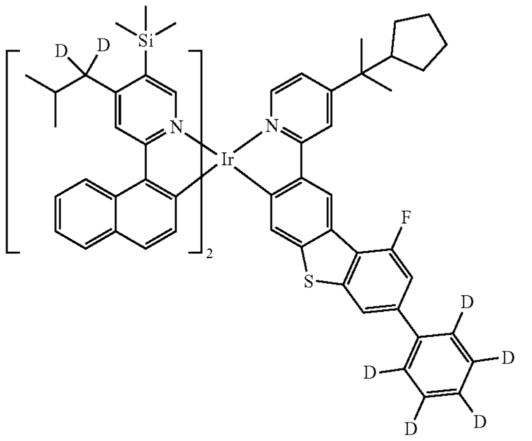
2714
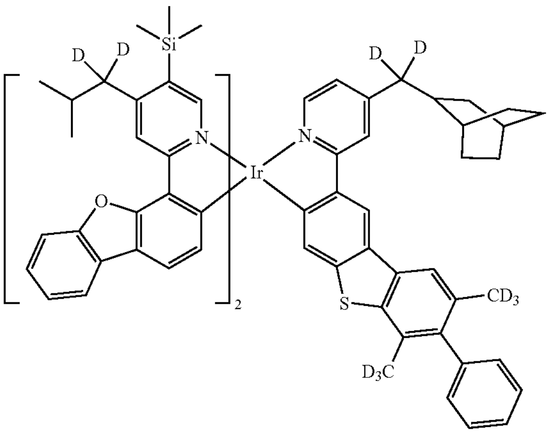
2715
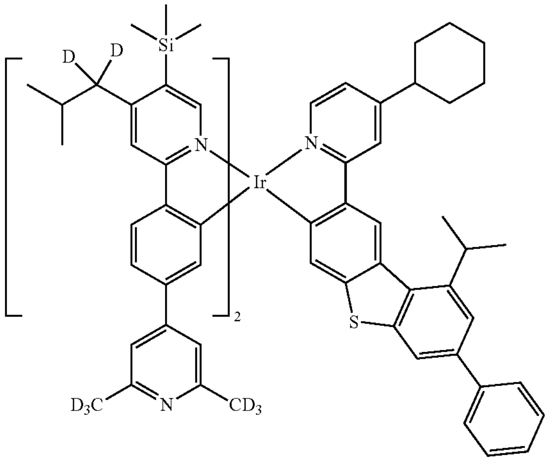
-continued
2716
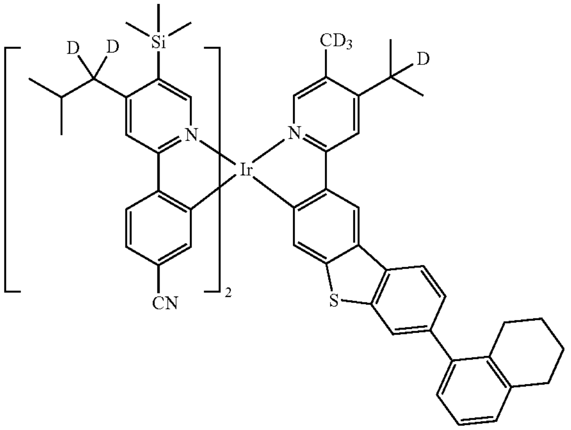
2717
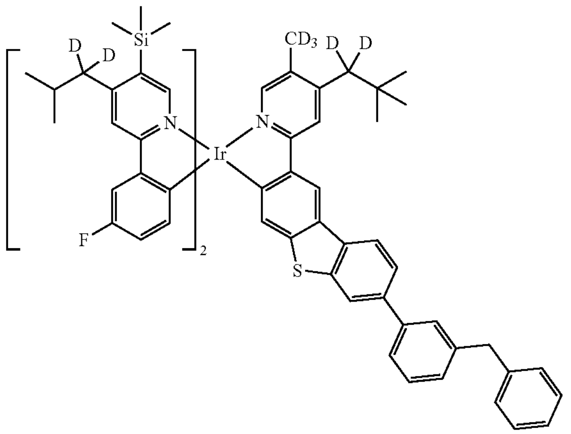
2718
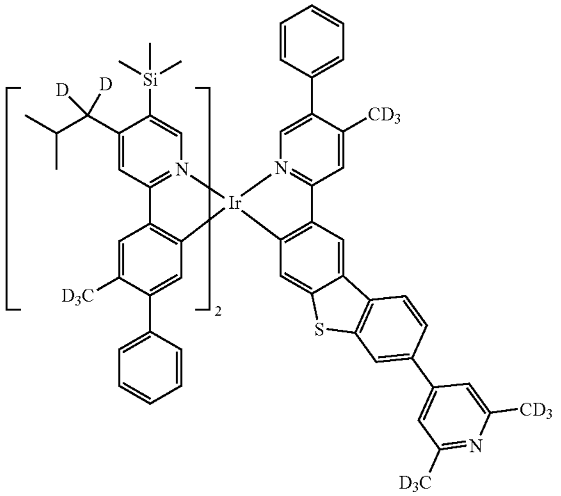

-continued
2719
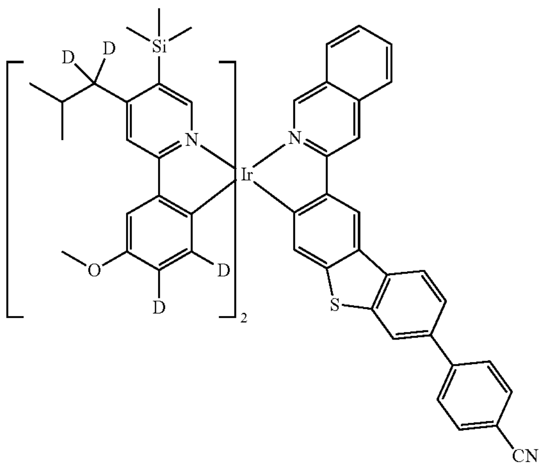
2720
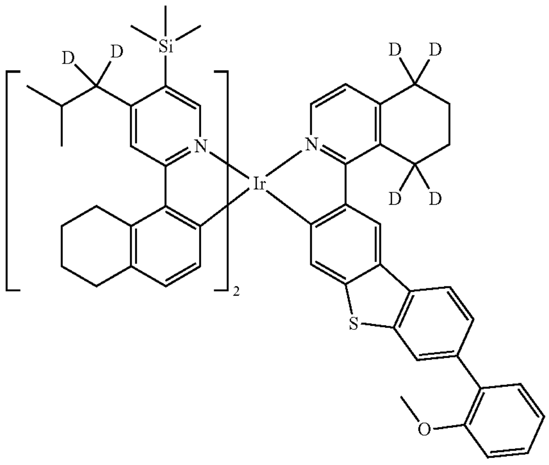
2721
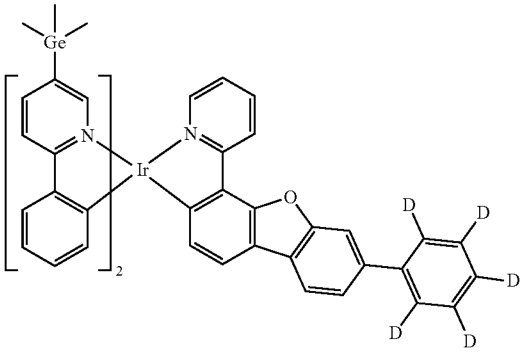
-continued
2722
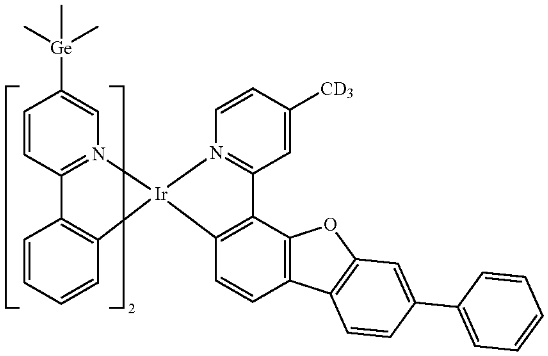
2723
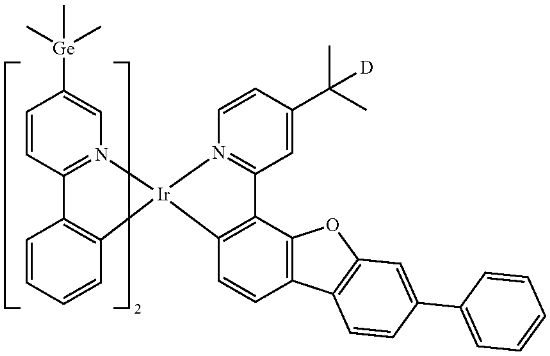
2724
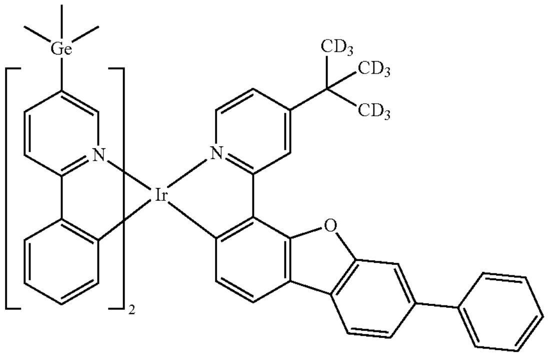
2725
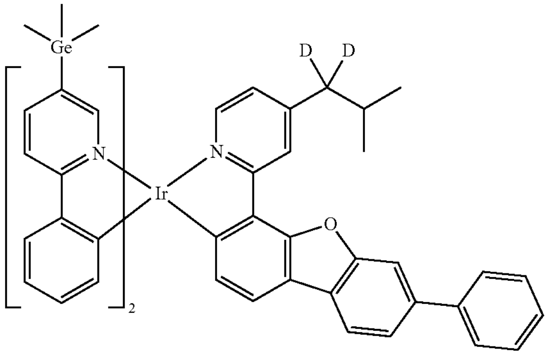

2726
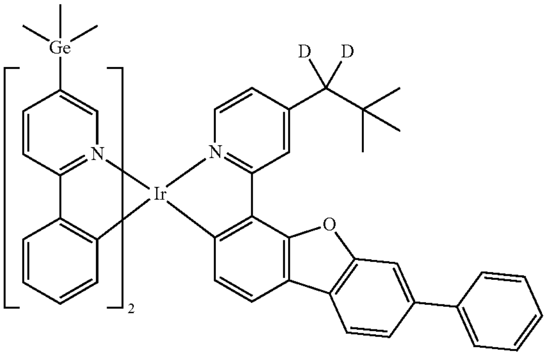
2727
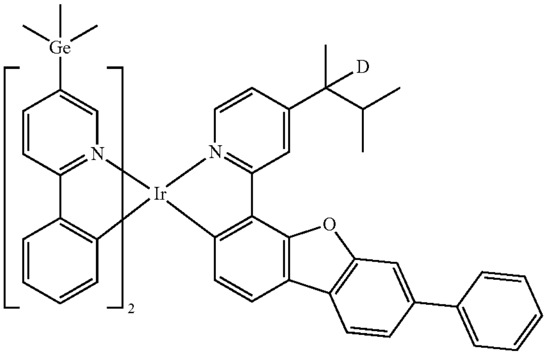
2728
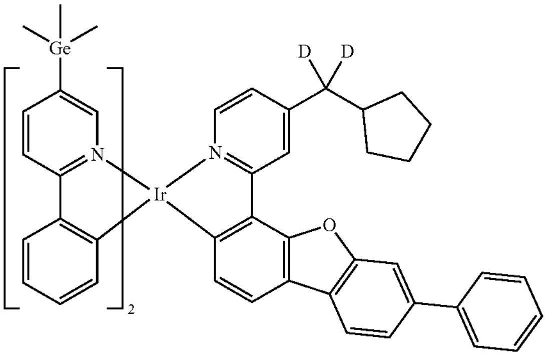
2729
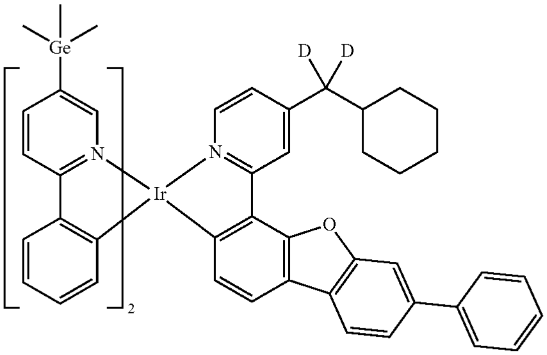
2730
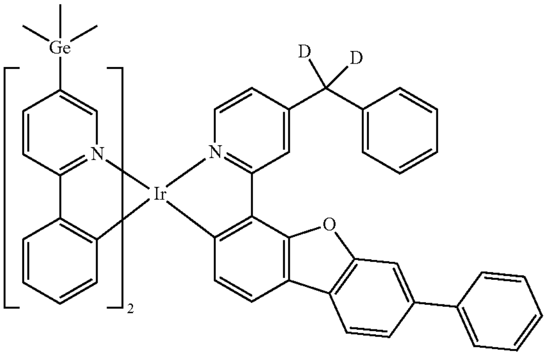
2731
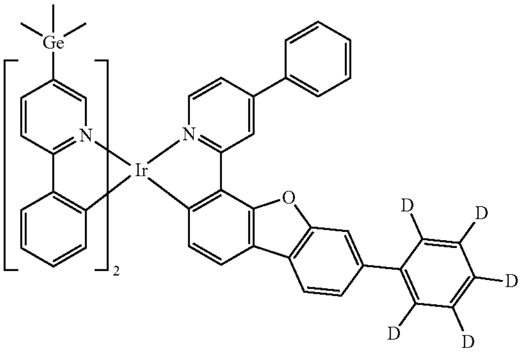
2732
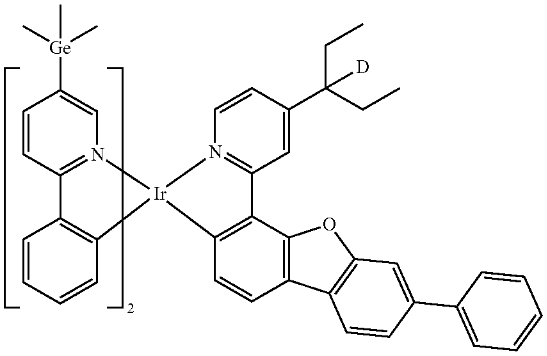
2733
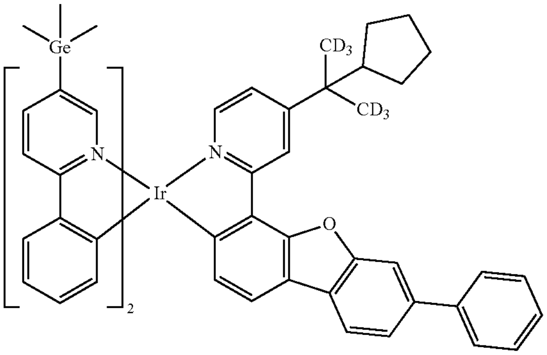

-continued
2734
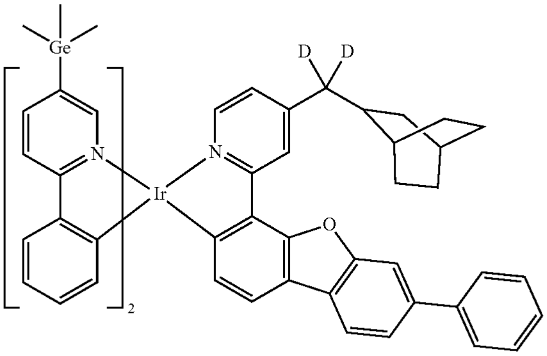
2735
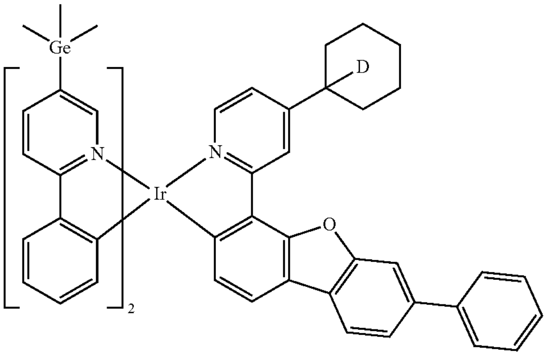
2736
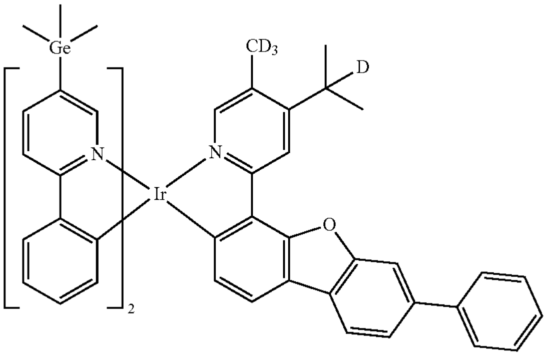
2737
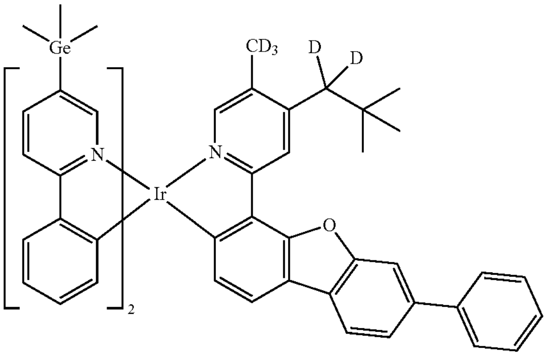
-continued
2738
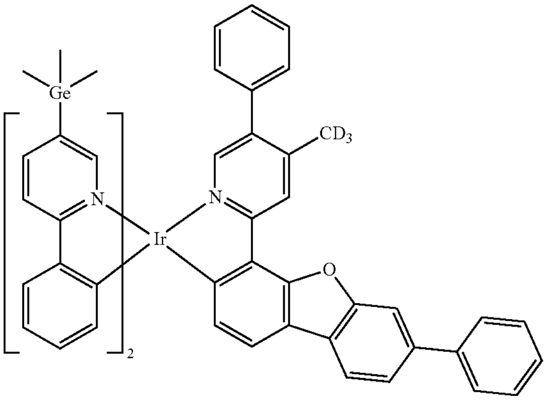
2739
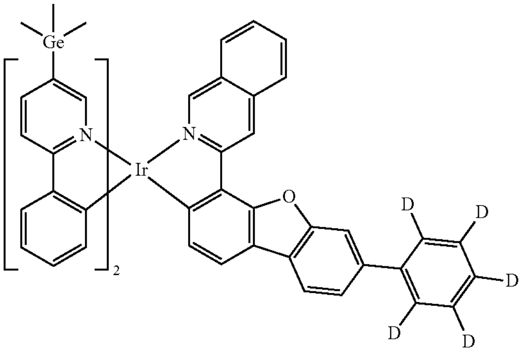
2740
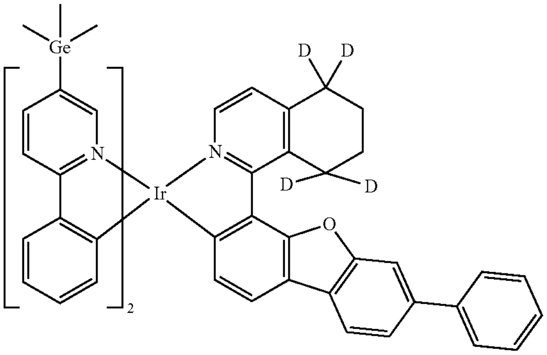
2741
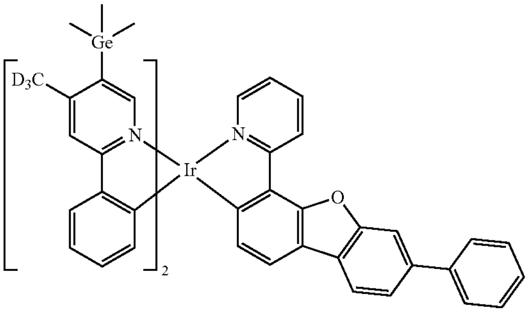

-continued
2742
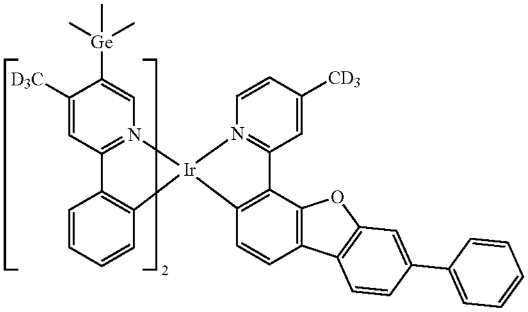
2743
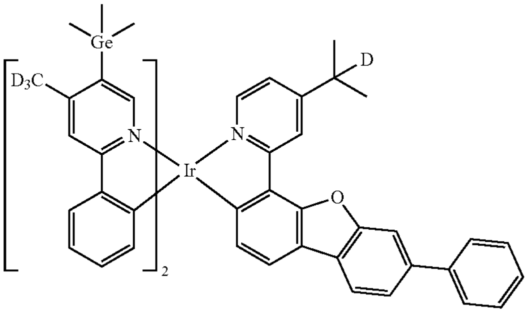
2744
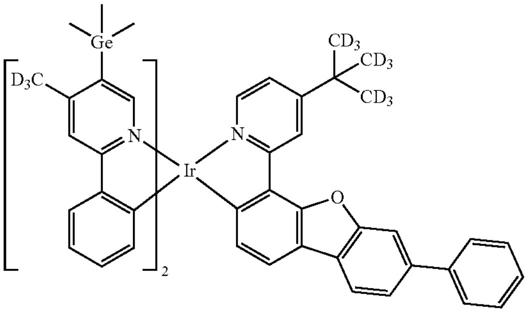
2745
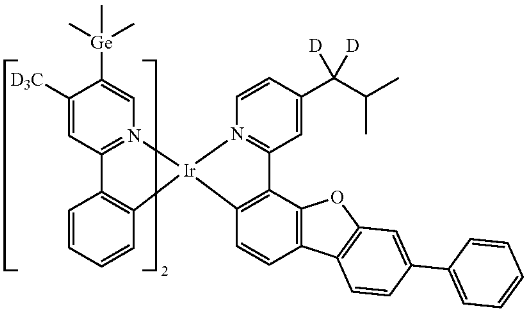
-continued
2746
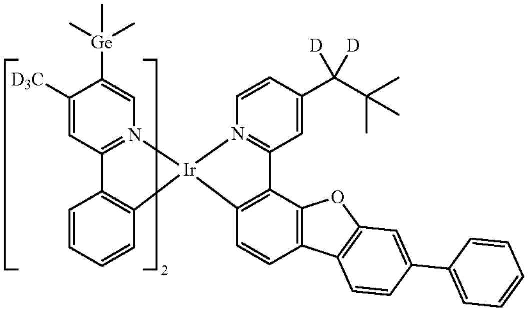
2747
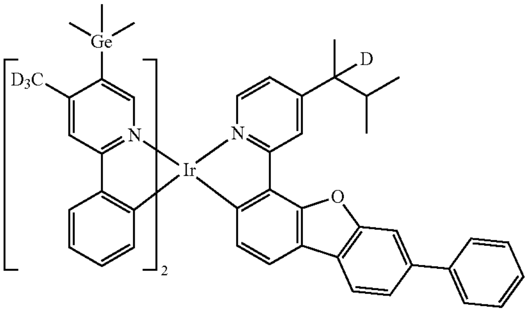
2748
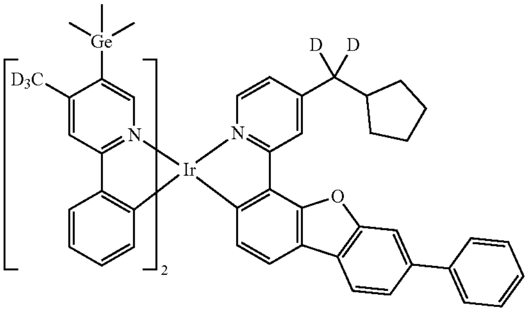
2749
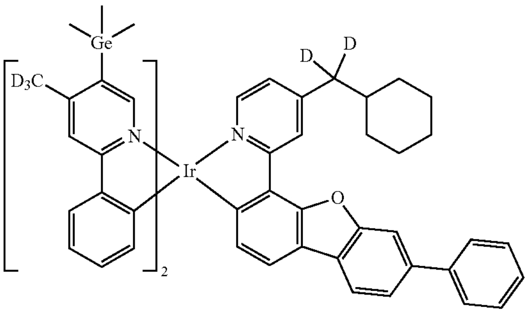

-continued
2750
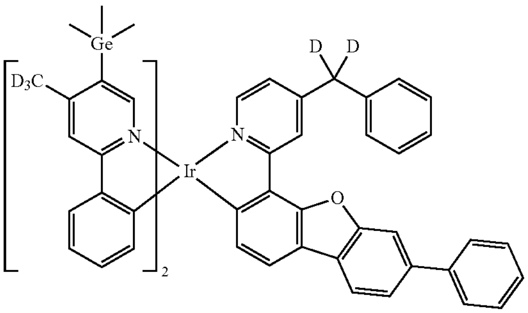
2751
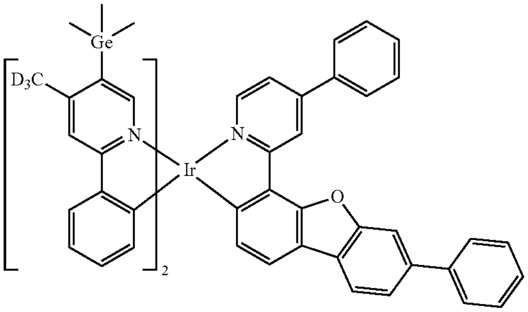
2752
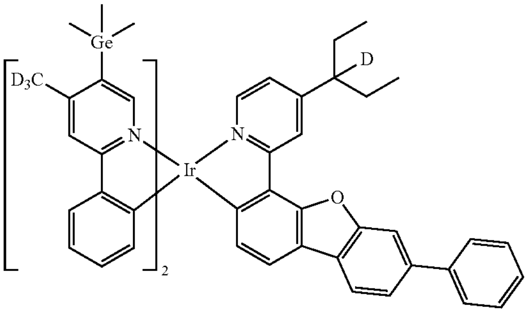
2753
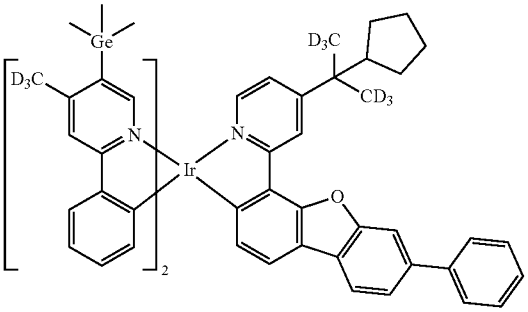
-continued
2754
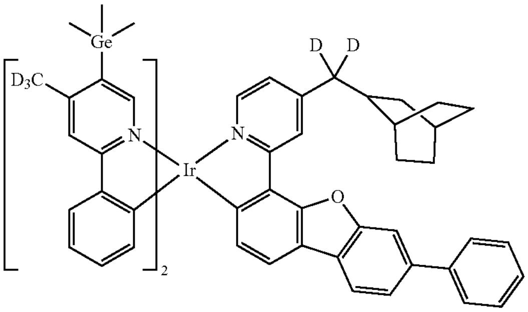
2755
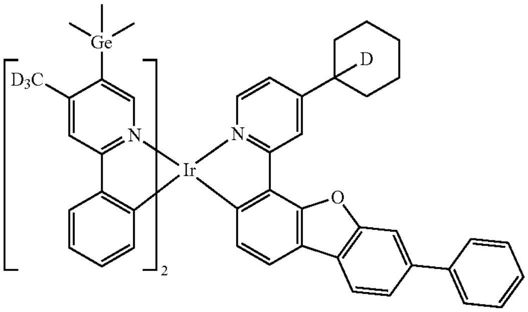
2756
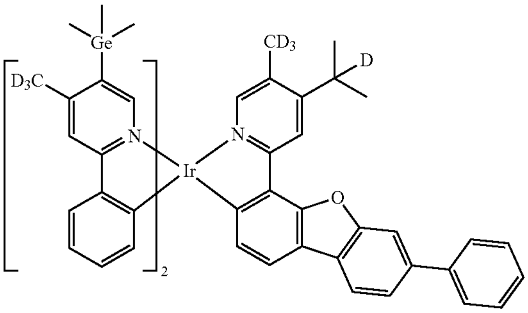
2757
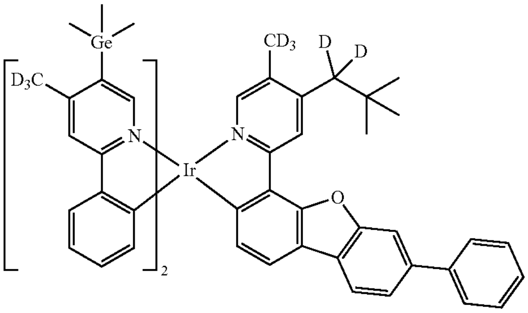

-continued
2758
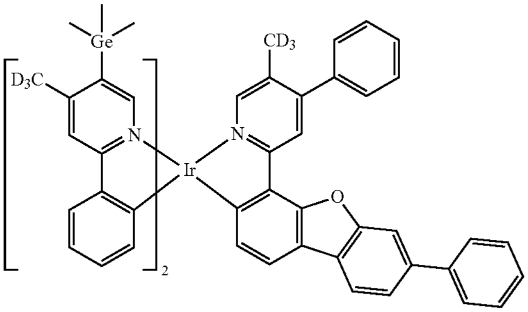
2759
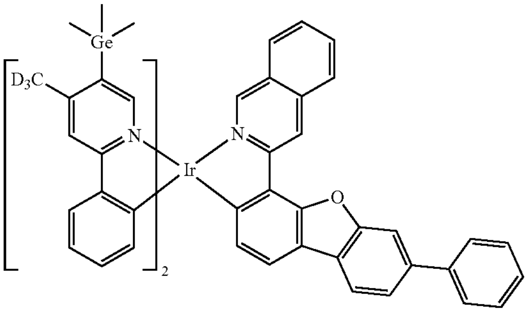
2760
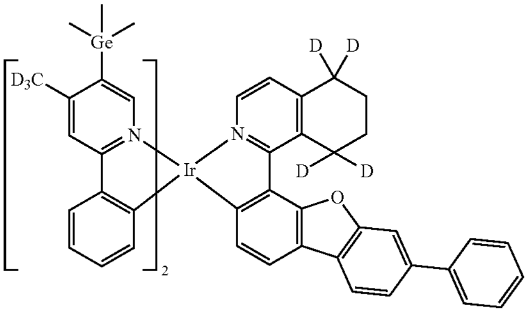
2761
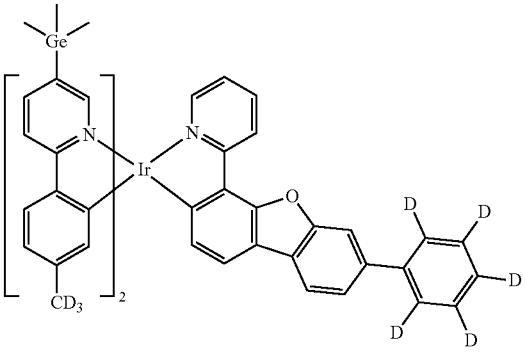
-continued
2762
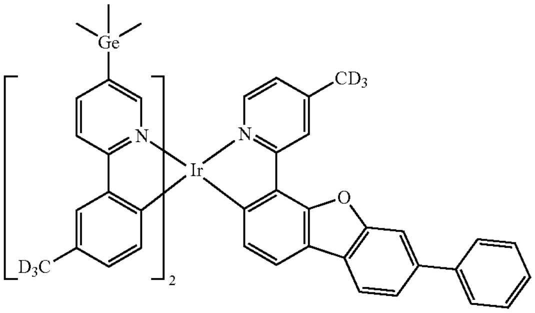
2763
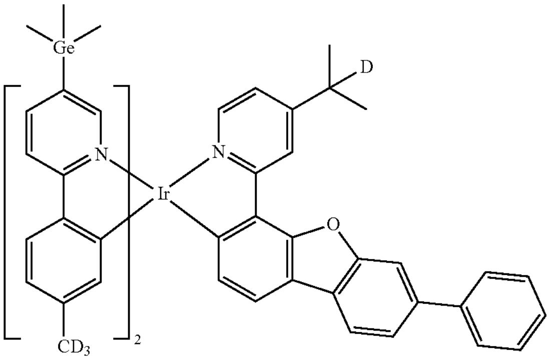
2764
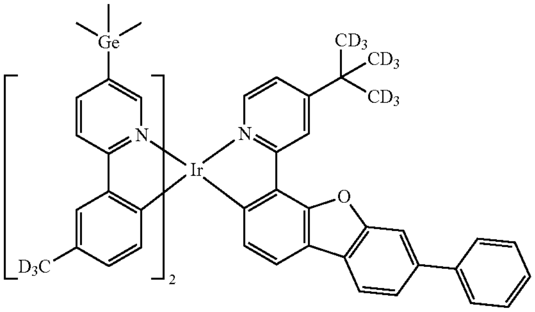
2765
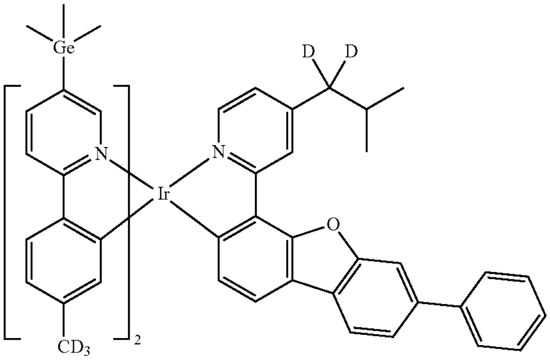

2766
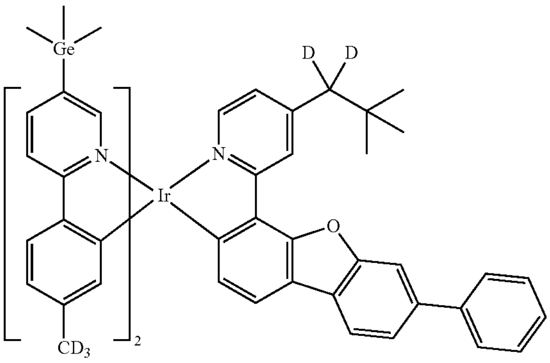
2767
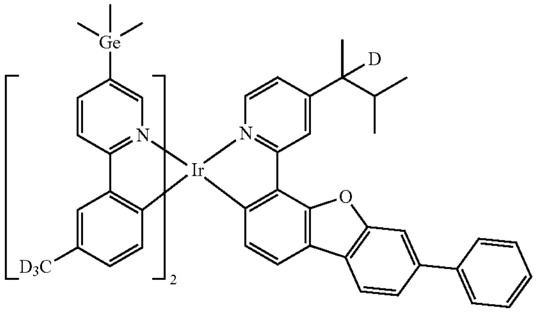
2768
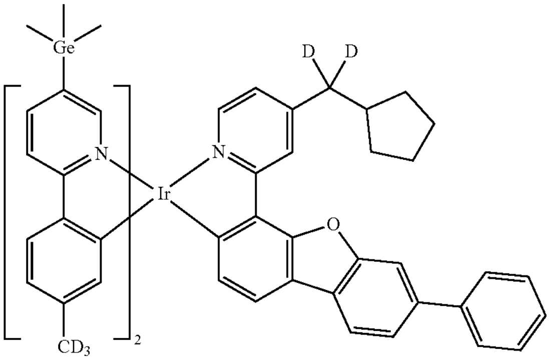
2769
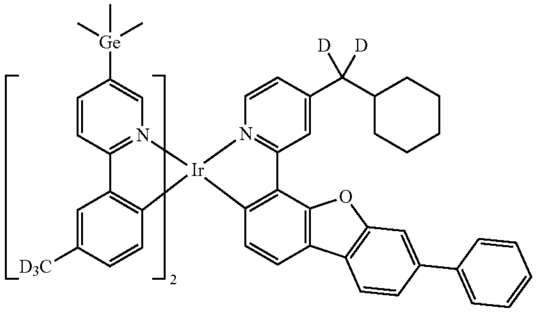
2770
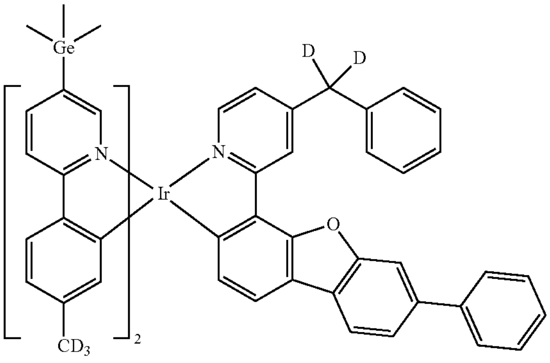
2771
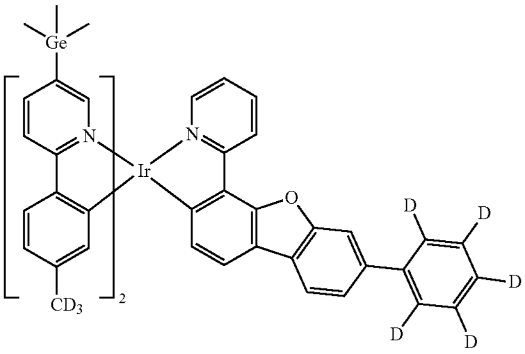
2772
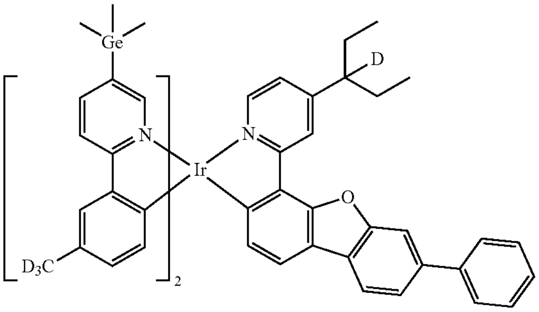
2773
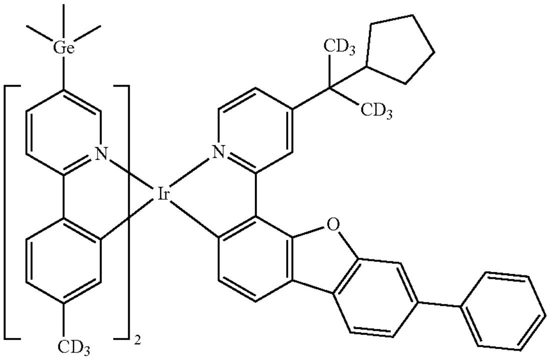

-continued
2774
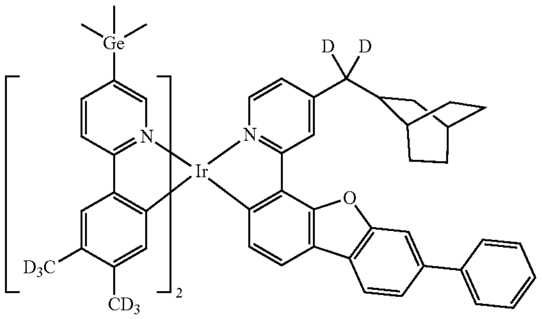
2775
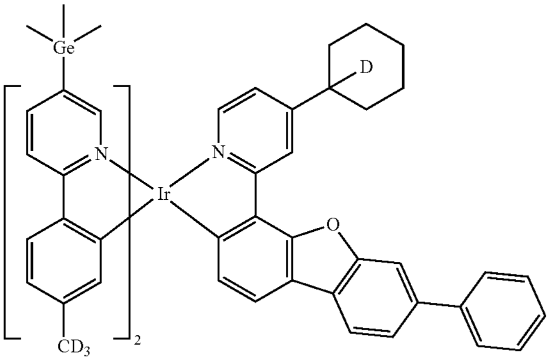
2776
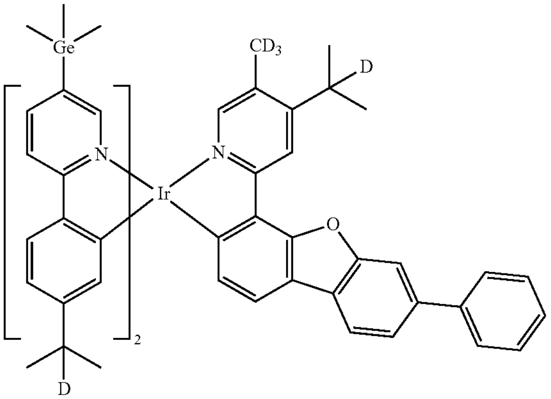
2777
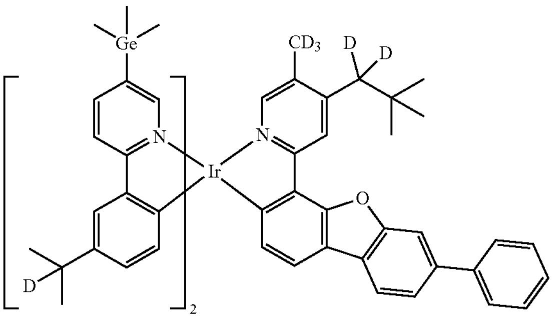
-continued
2778
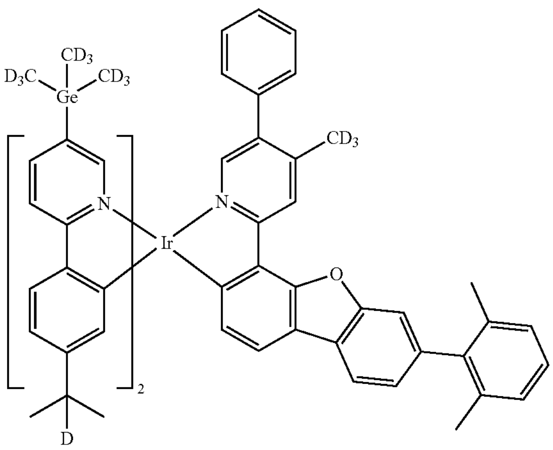
2779
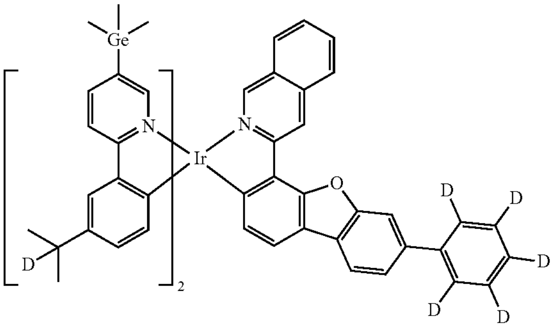
2780
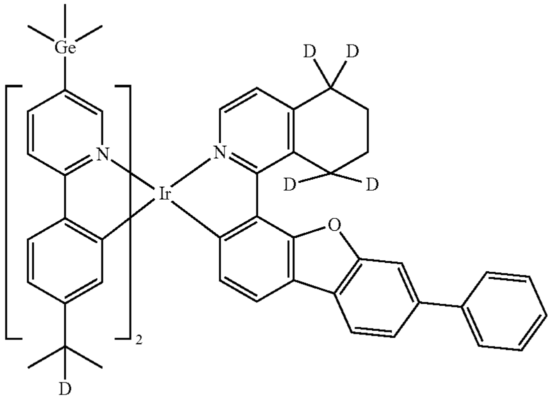

-continued
2781
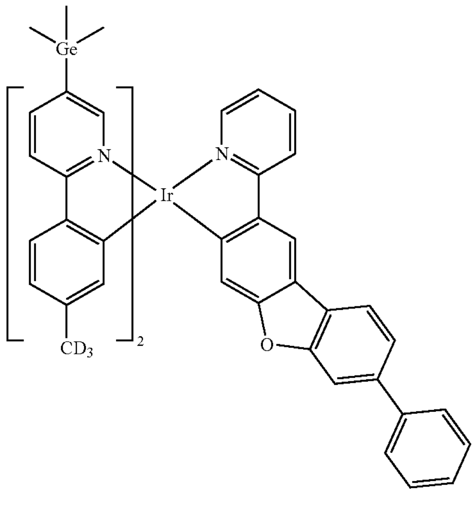
2782
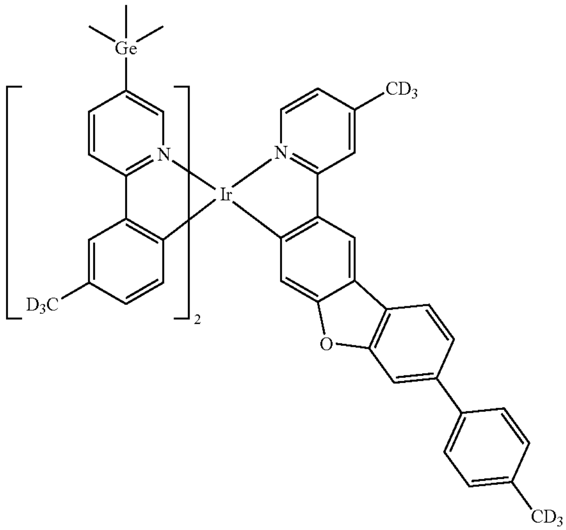
2783
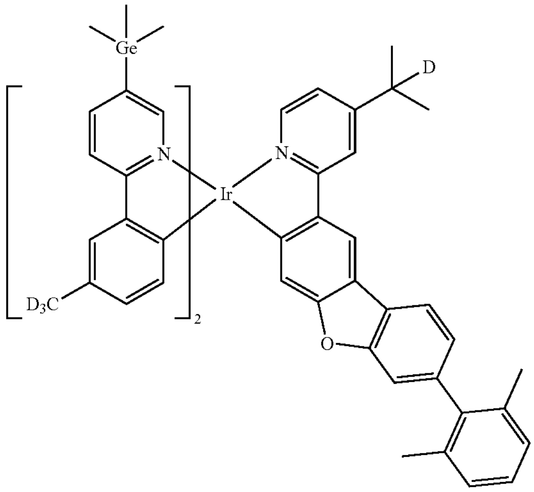
-continued
2784
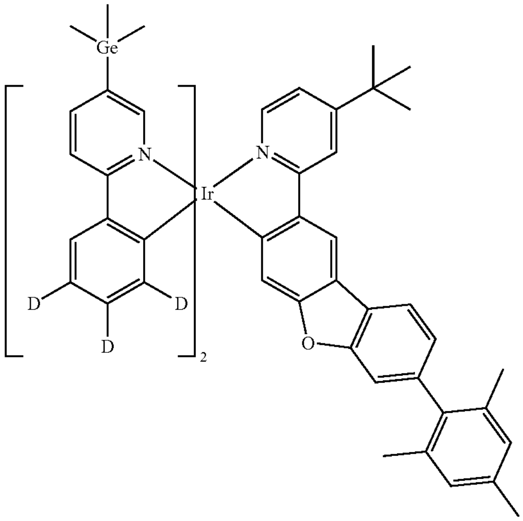
2785
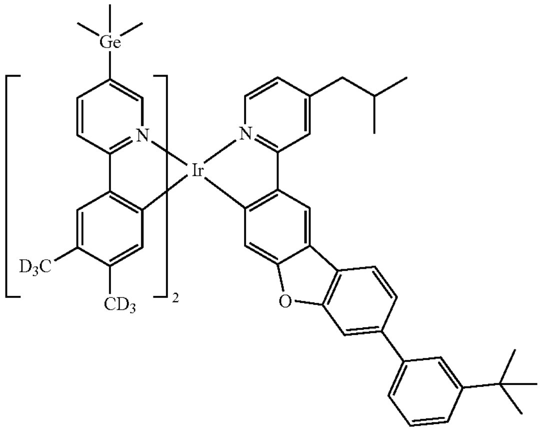
2786
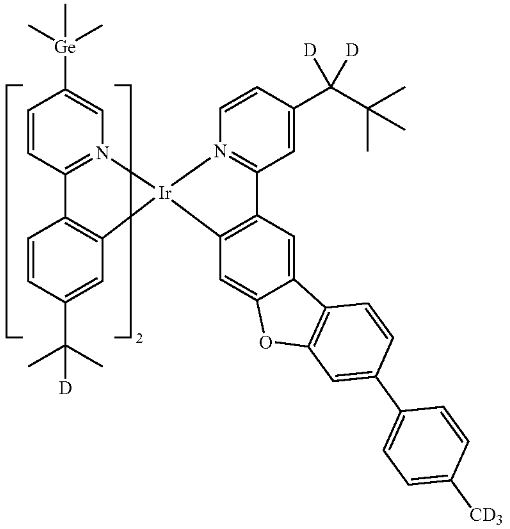

2787
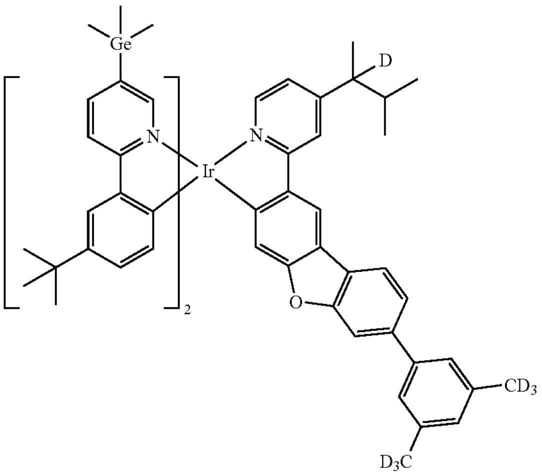
2788
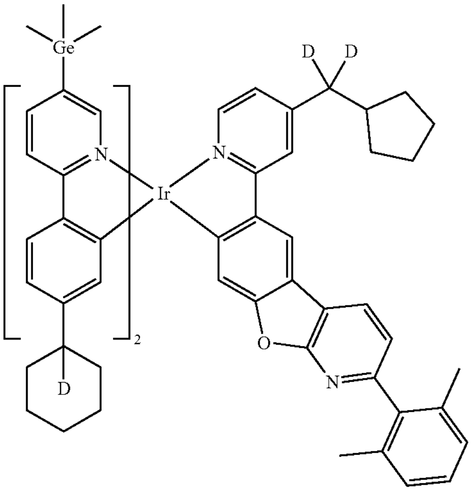
2789
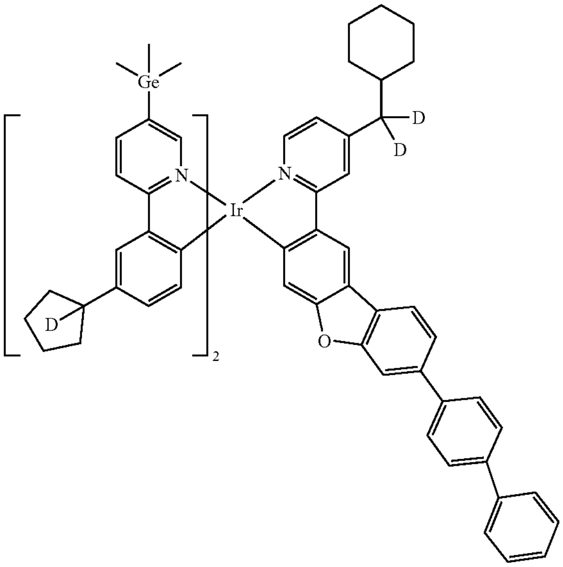
2790
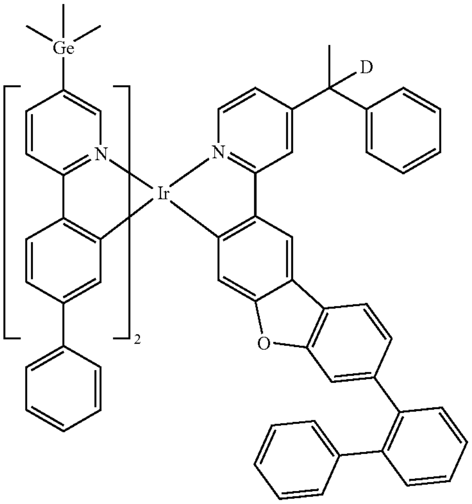
2791
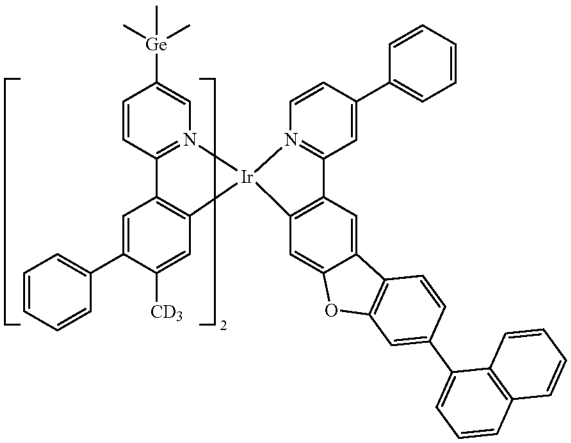
2792
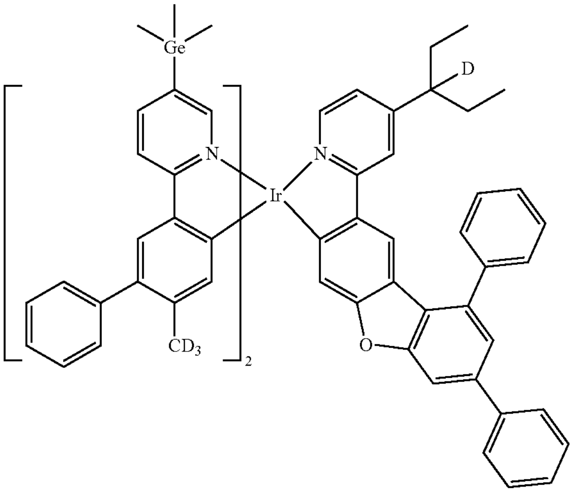

2793
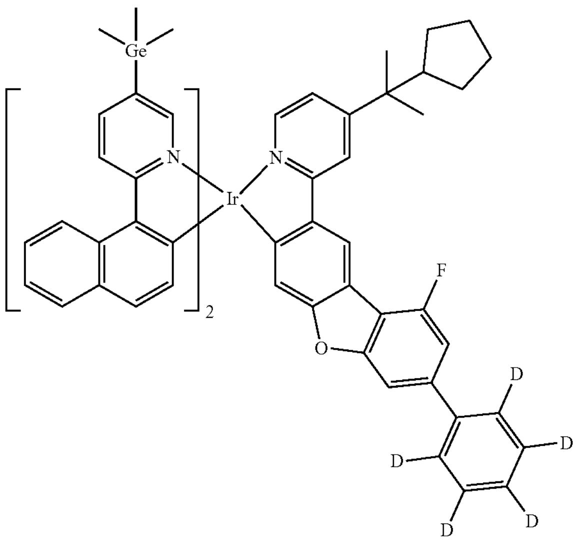
2794
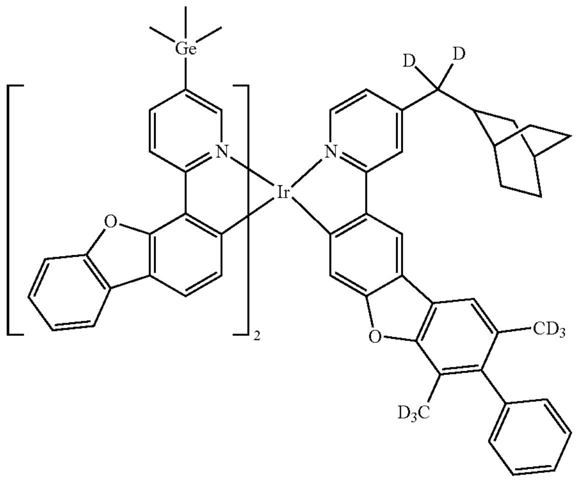
2795
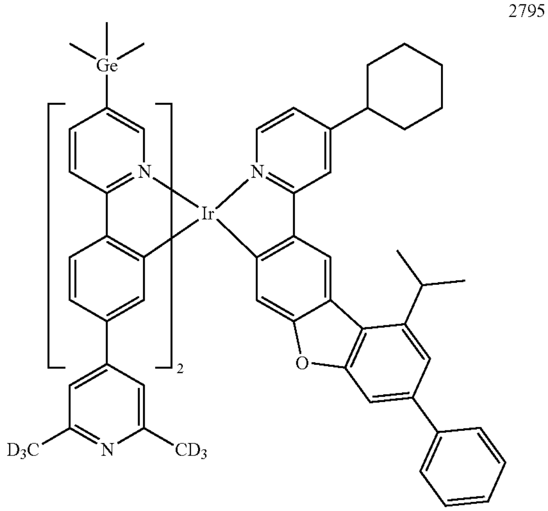
2796
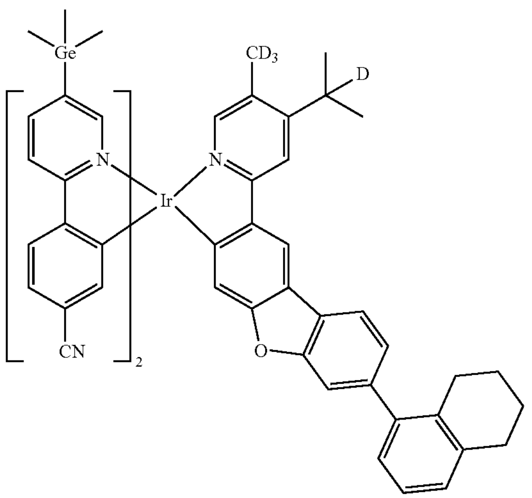
2797
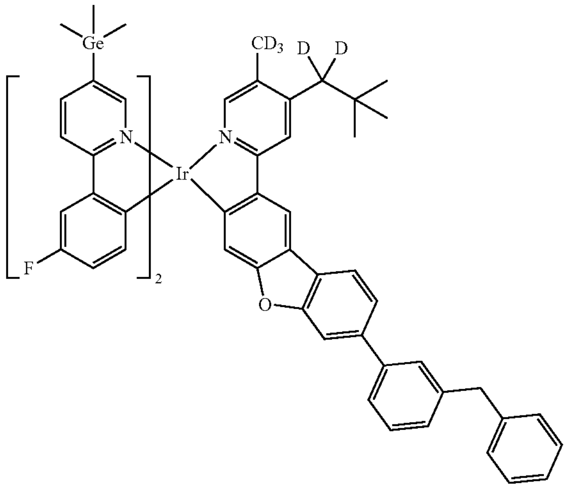
2798
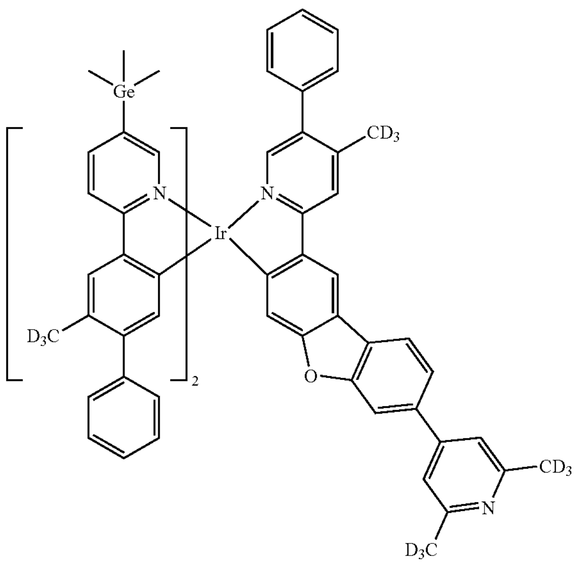

2799
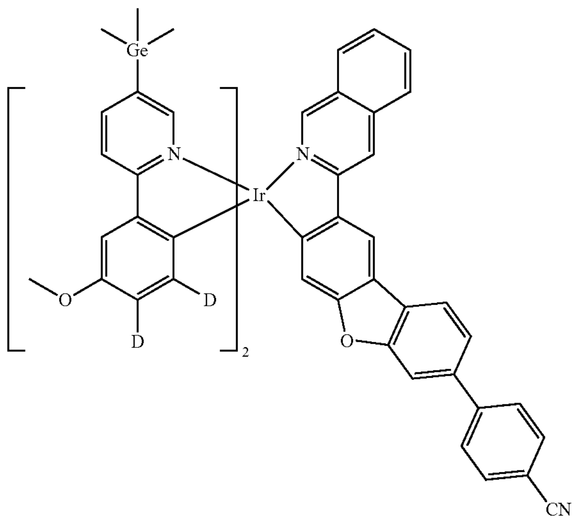
2800
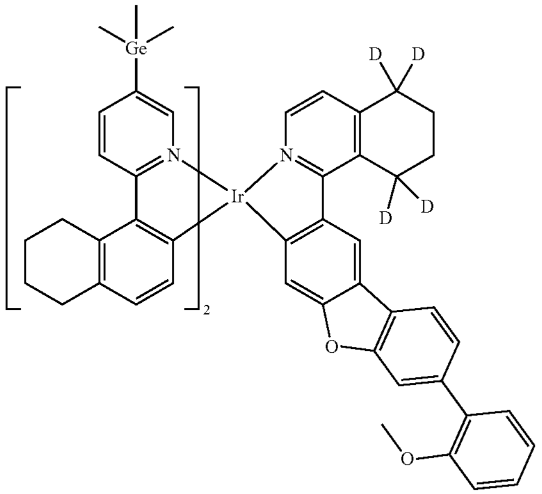
2801
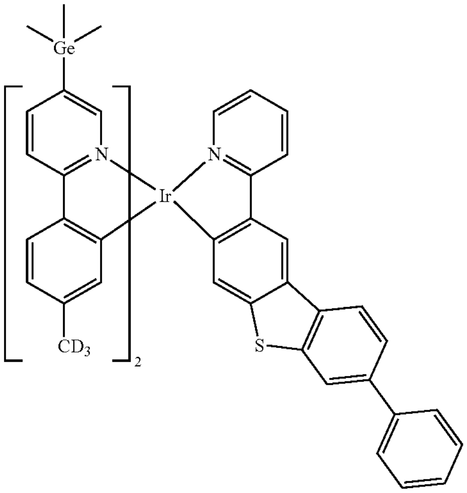
2802
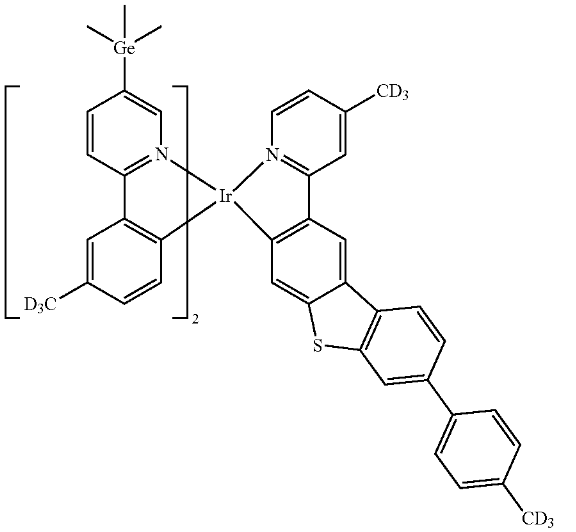
2803
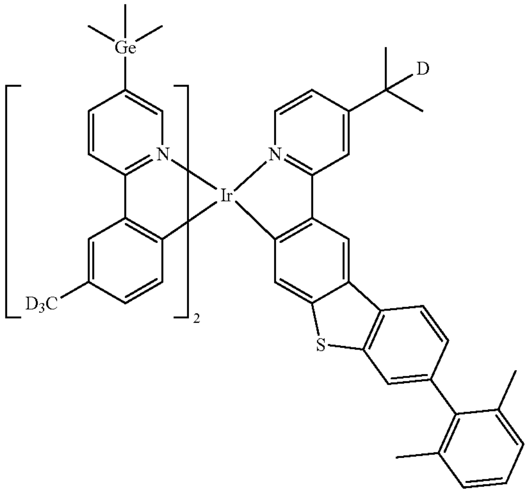
2804
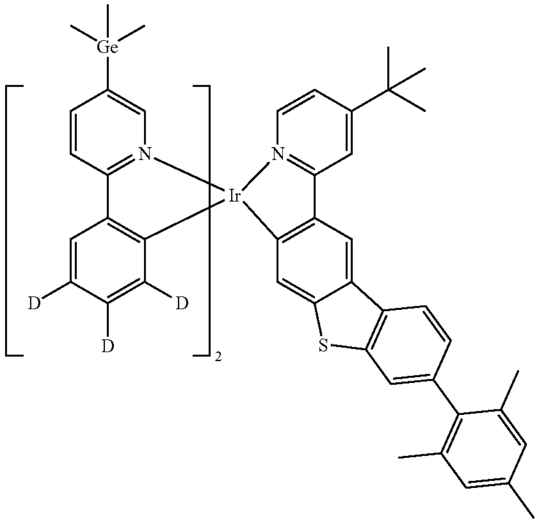

2805
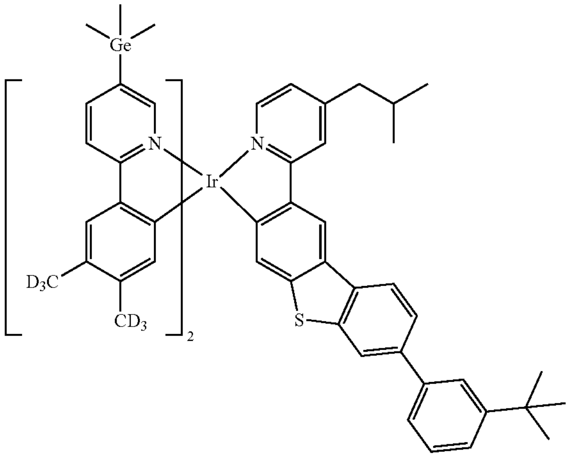
2806
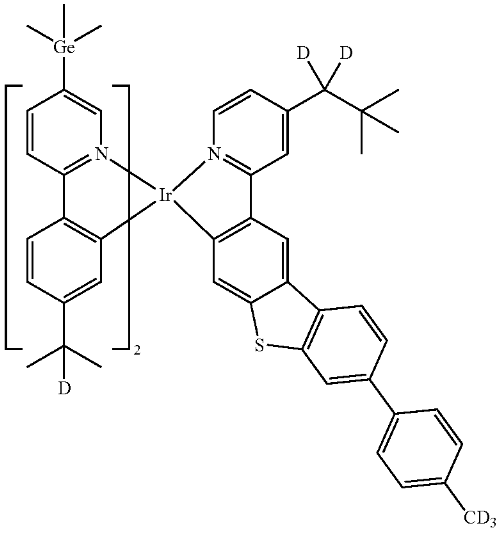
2807
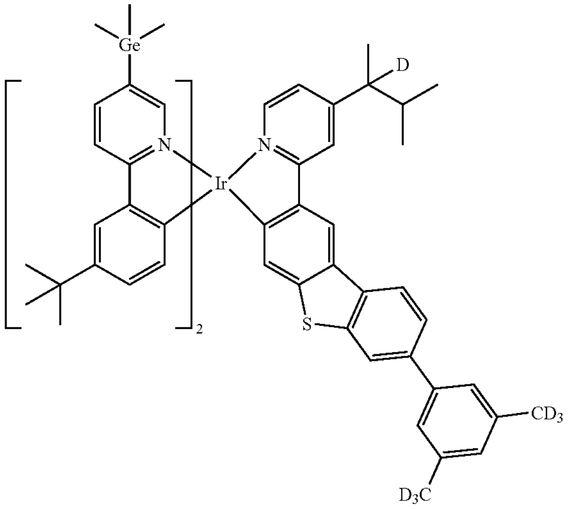
2808
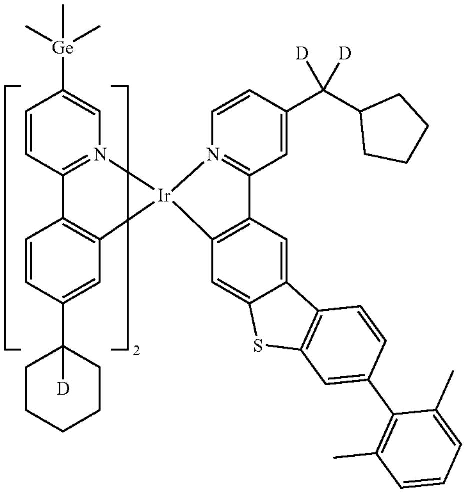
2809
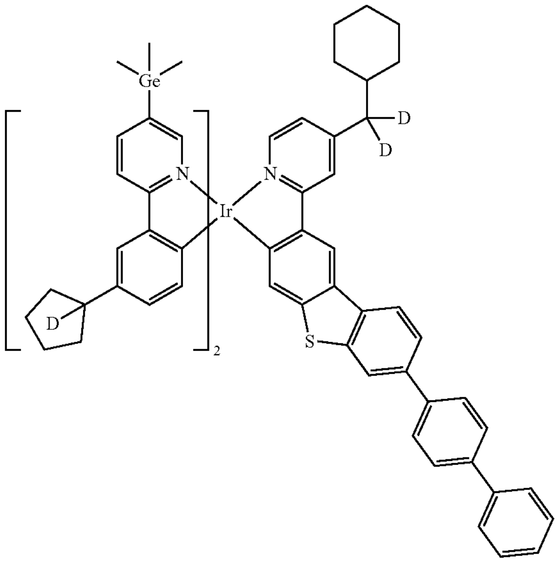

2810
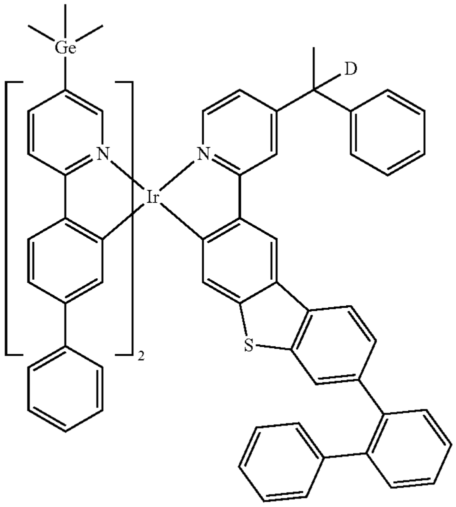
2811
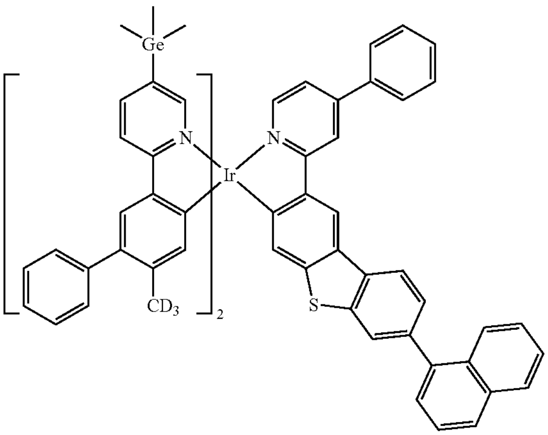
2812
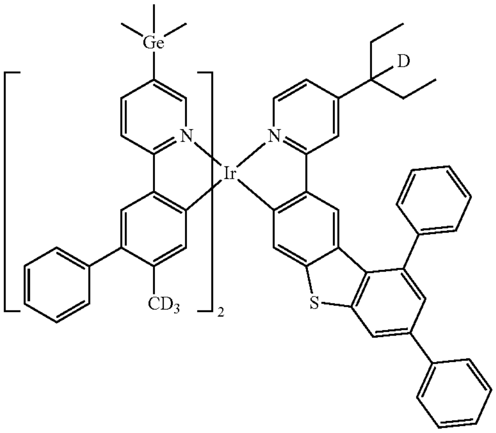
2813
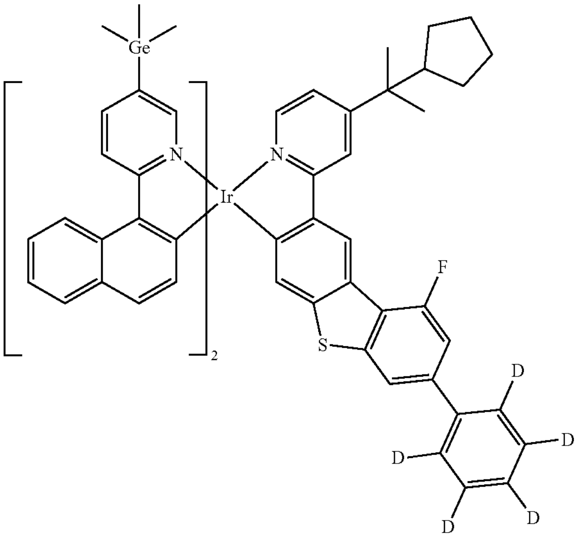
2814
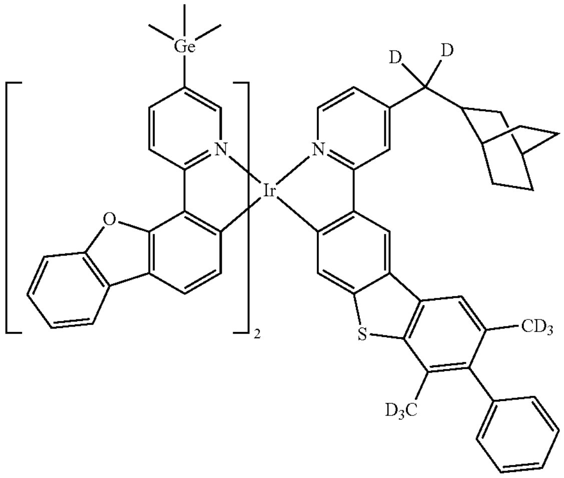
2815
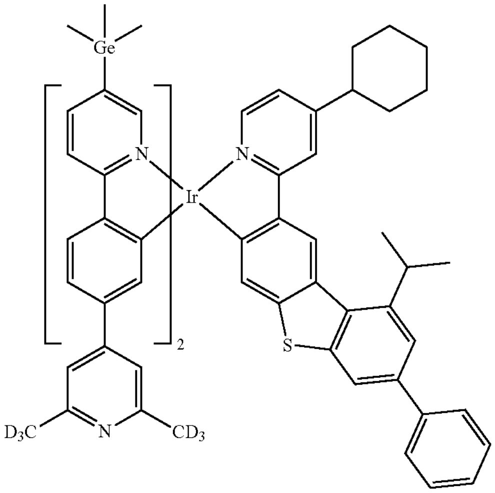

-continued
2816
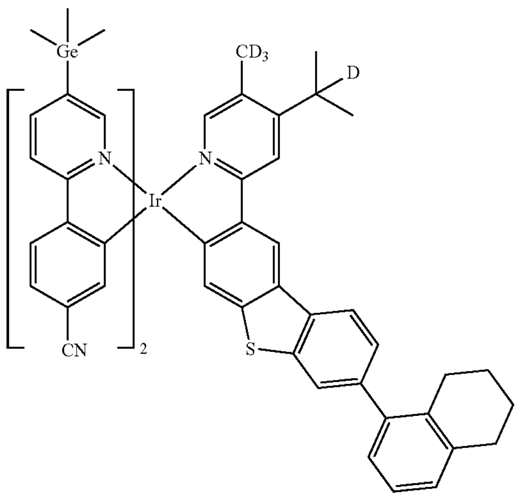
2817
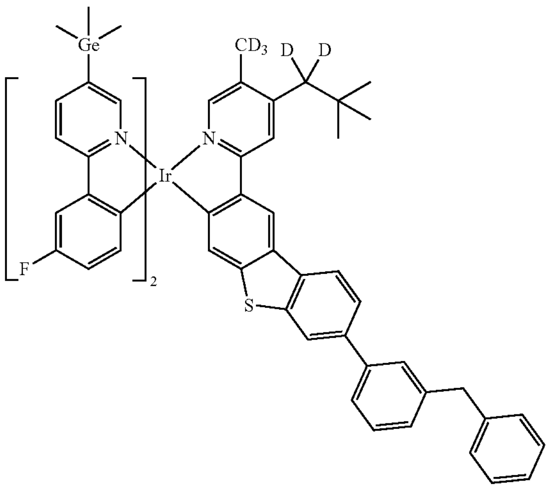
2818
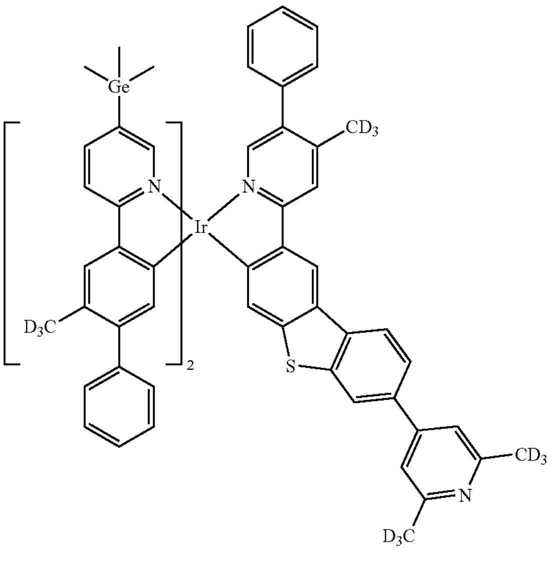
-continued
2819
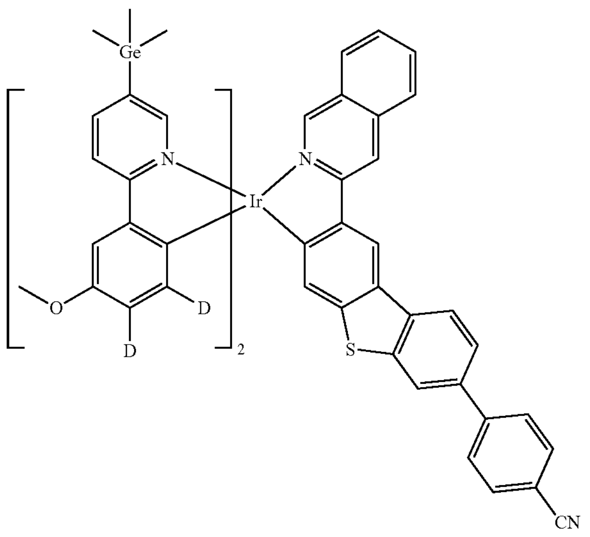
2820
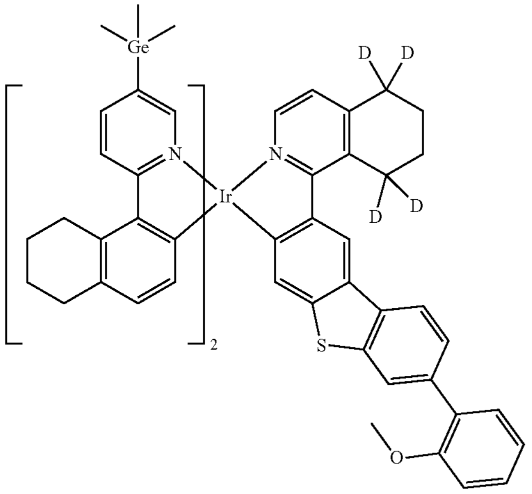
Group 1-7
1
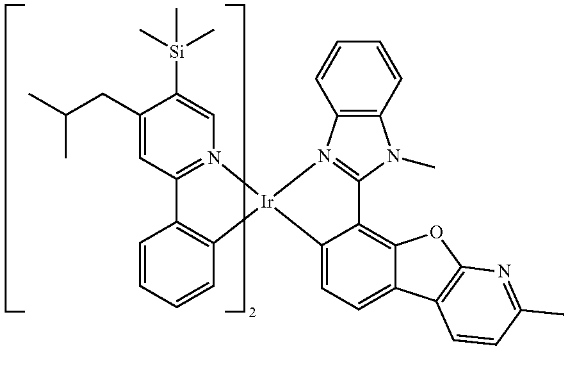

-continued
2
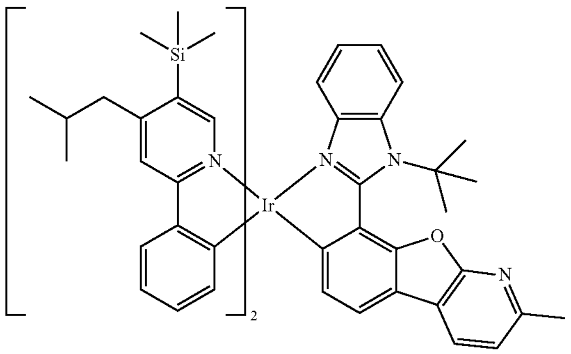
3
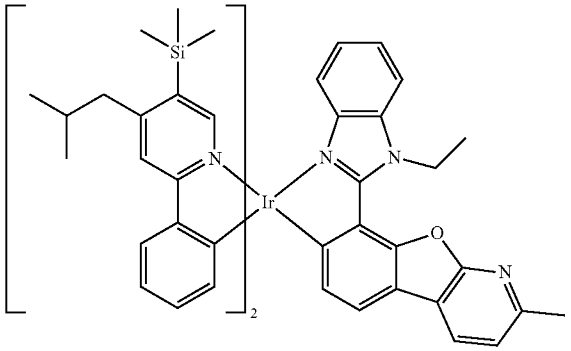
4
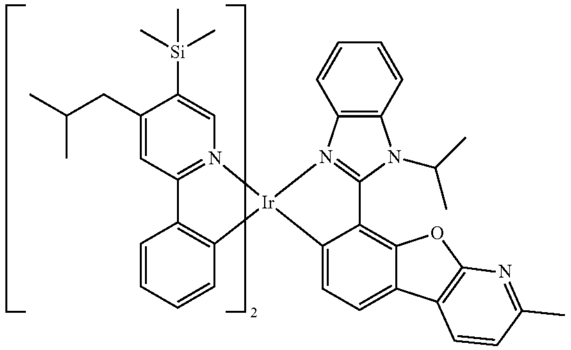
5
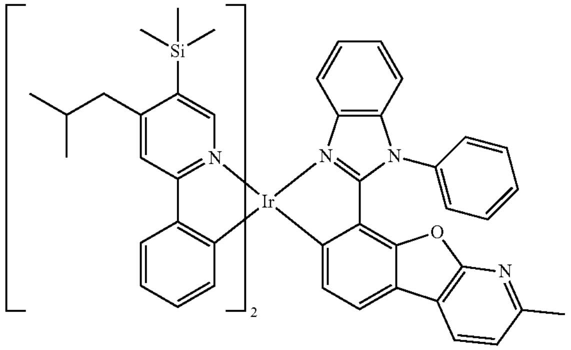
-continued
6
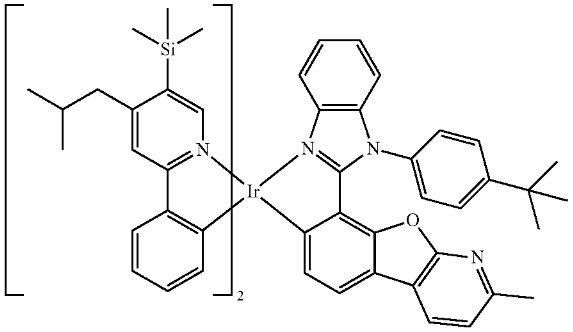
7
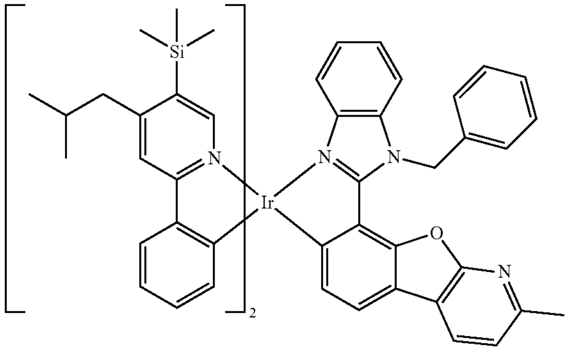
8
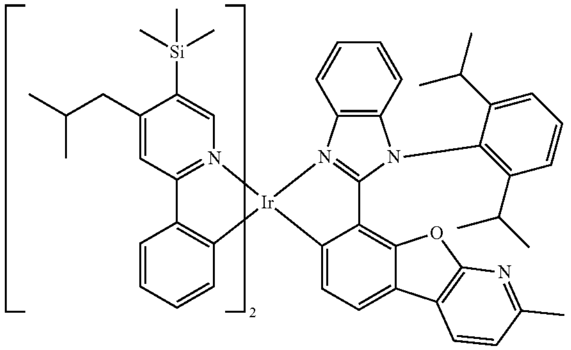
9
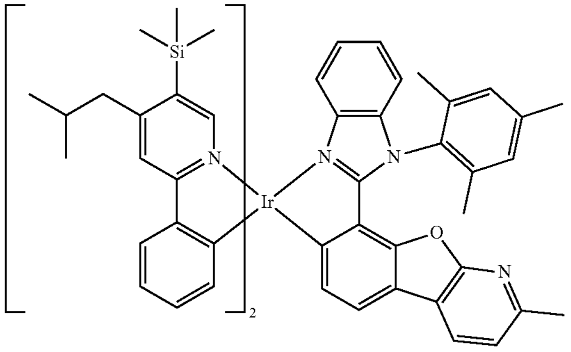

-continued
10
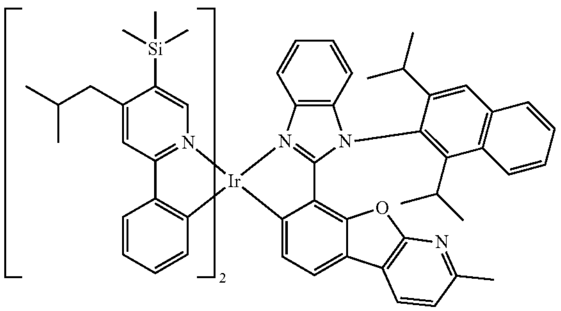
11
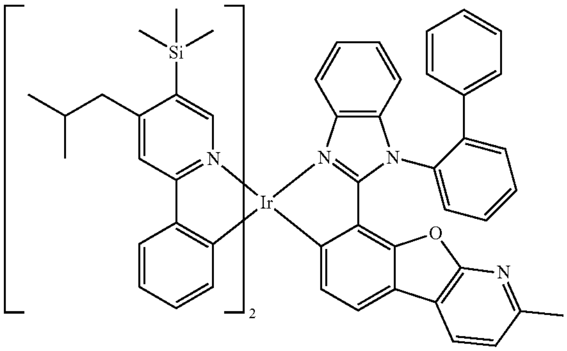
12
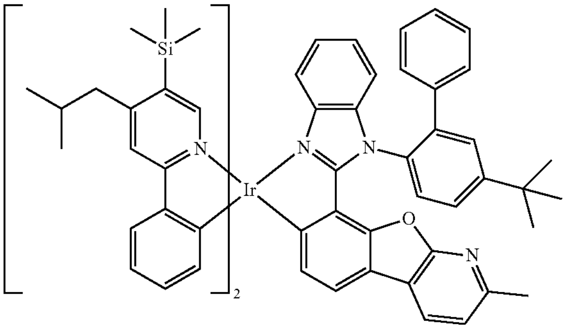
13
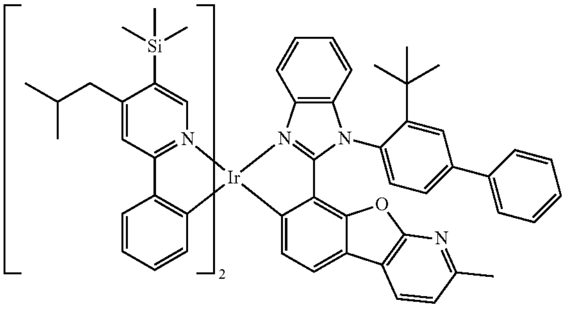
-continued
14
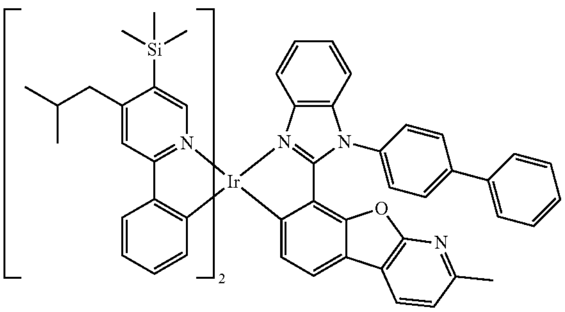
15
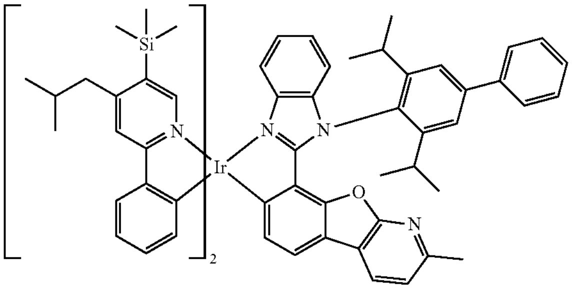
16
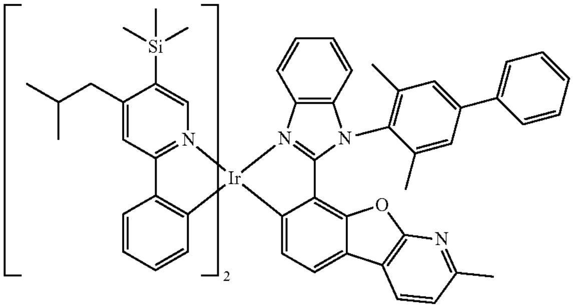
17
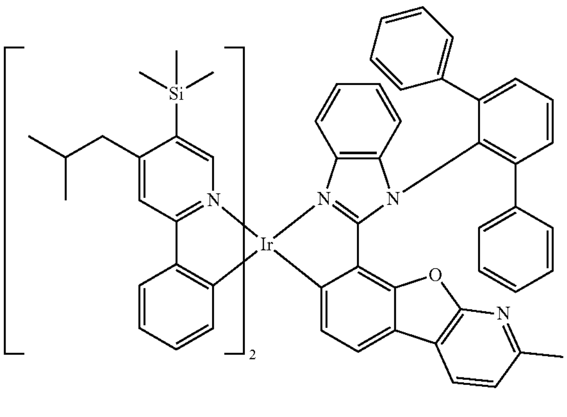

-continued
18
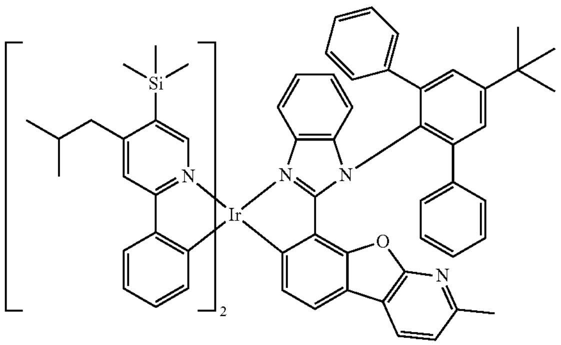
19
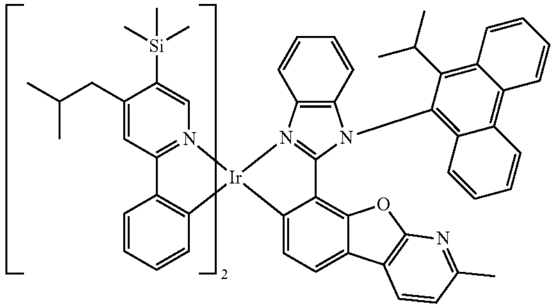
20
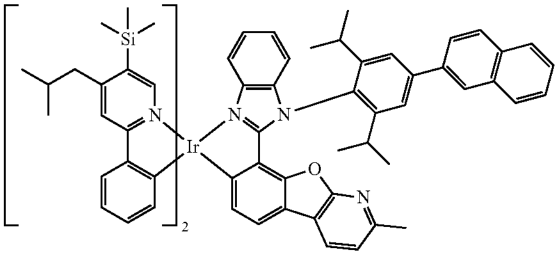
21
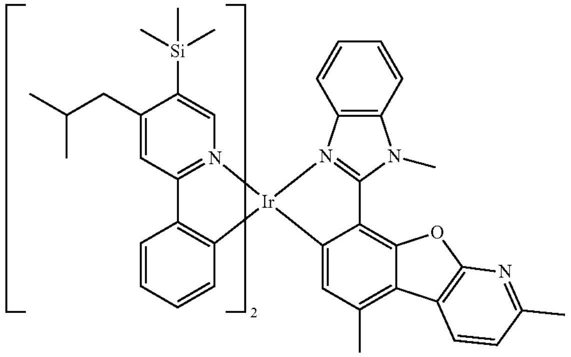
-continued
22
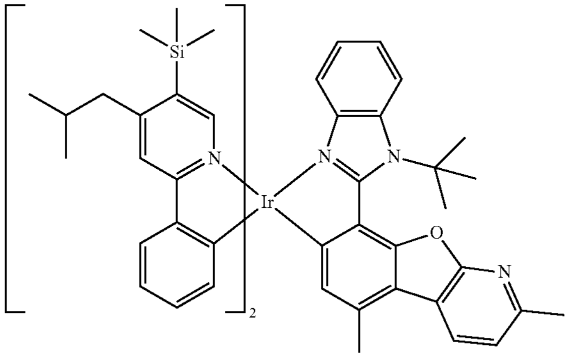
23
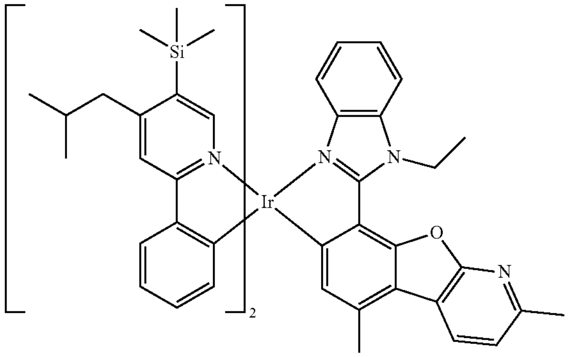
24
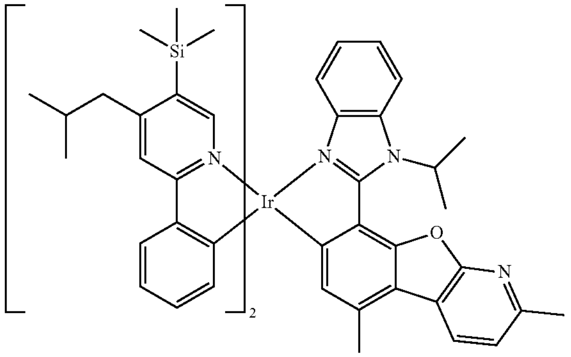
25
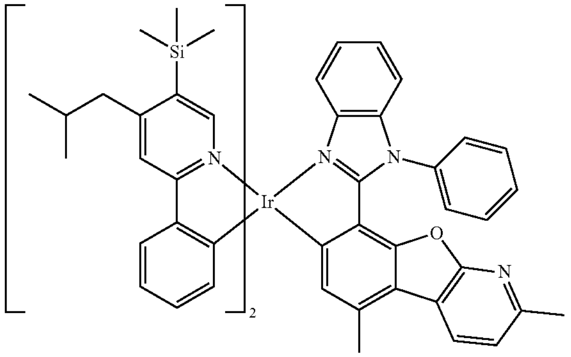

-continued
26
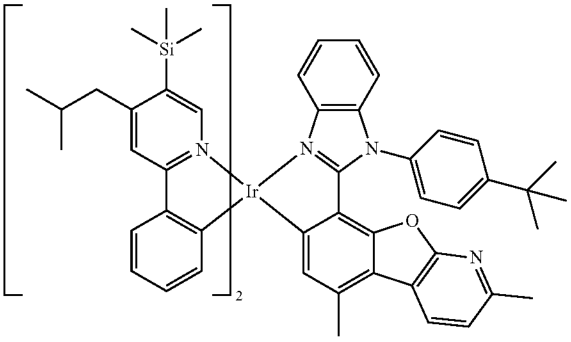
27
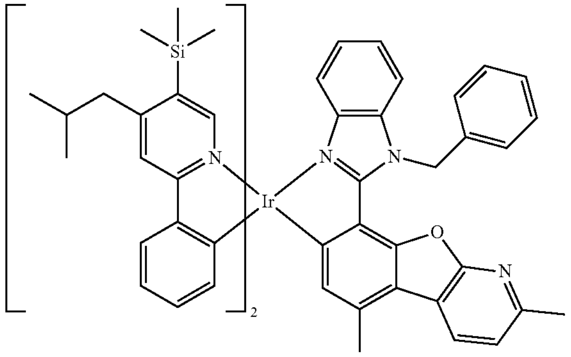
28
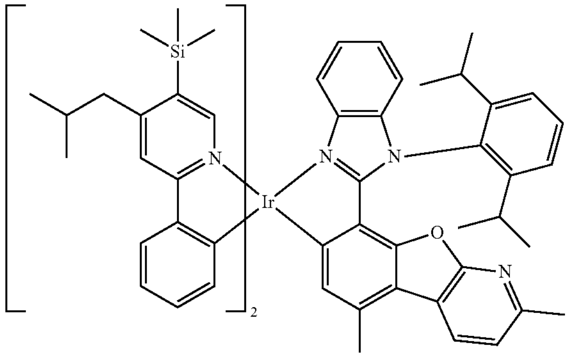
29
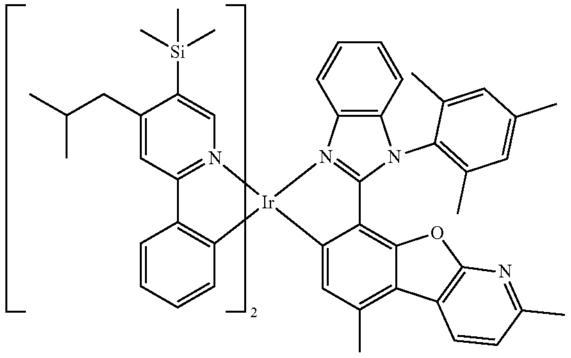
-continued
30
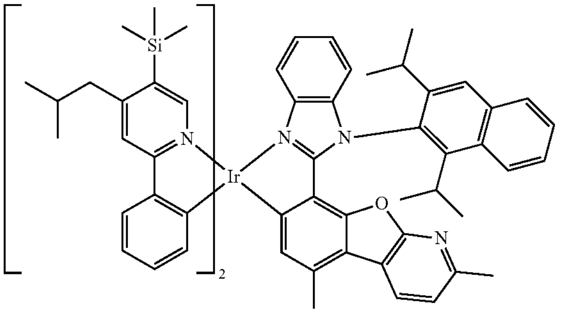
31
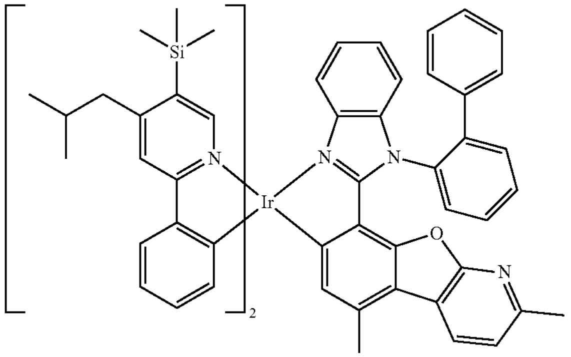
32
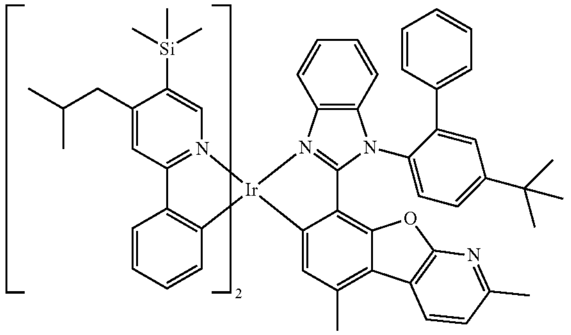
33
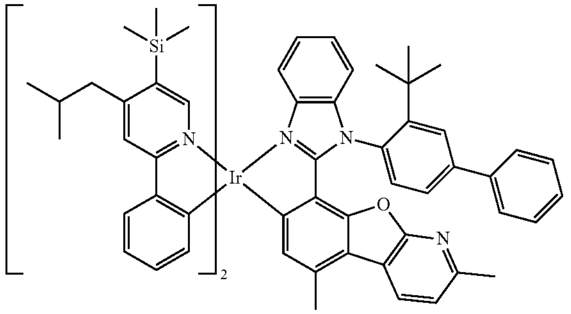

-continued
34
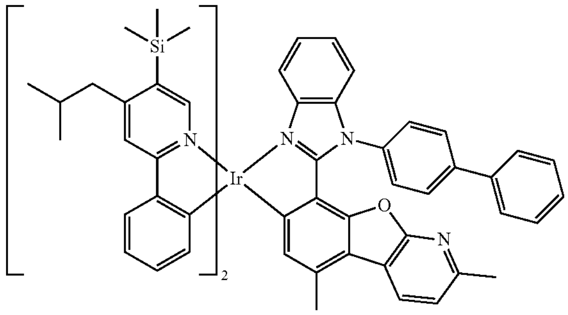
35
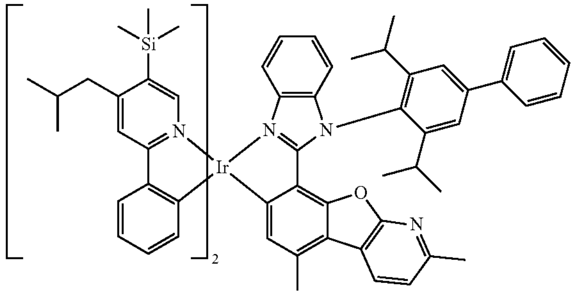
36
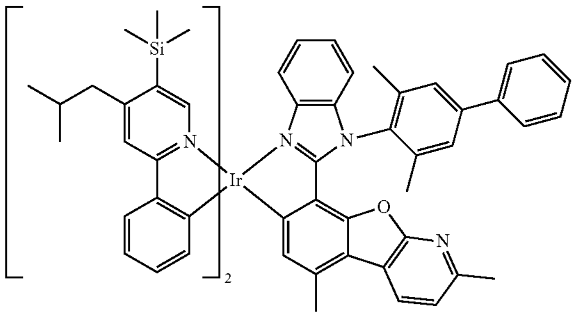
37
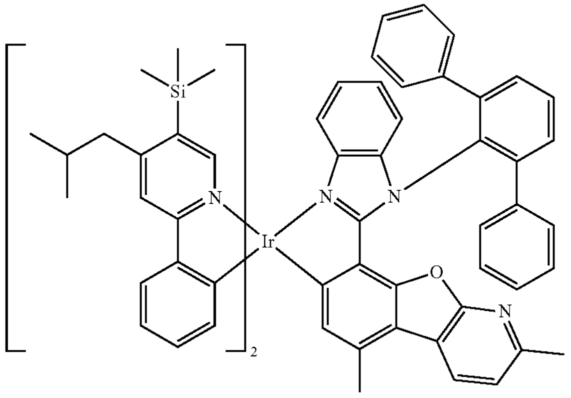
-continued
38
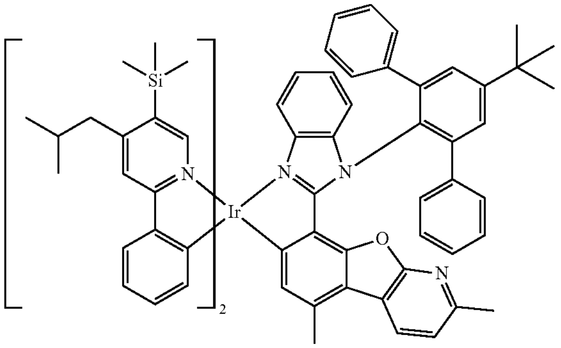
39
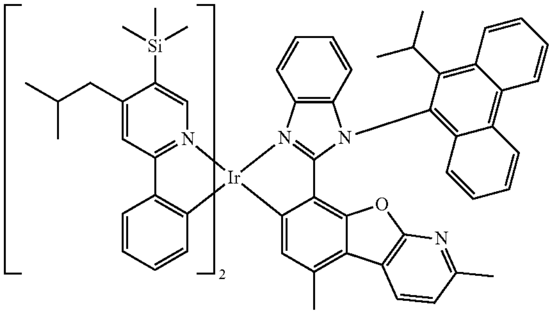
40
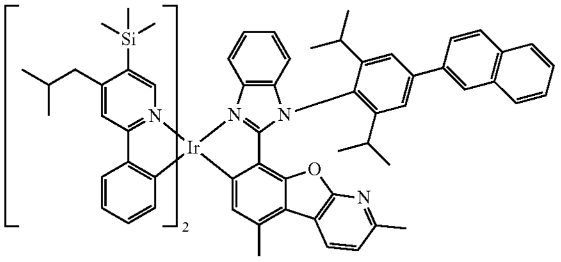
41
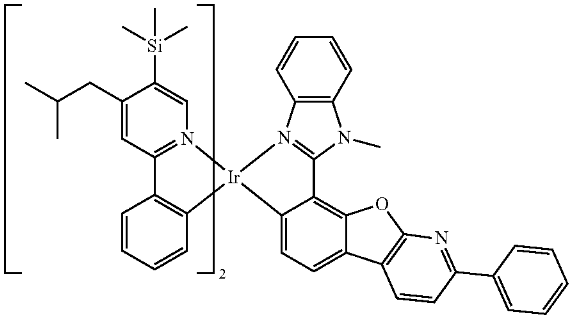

-continued
42
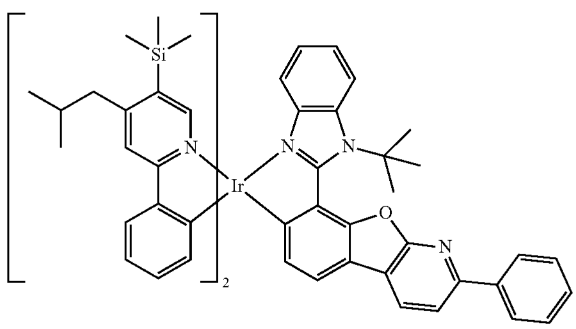
43
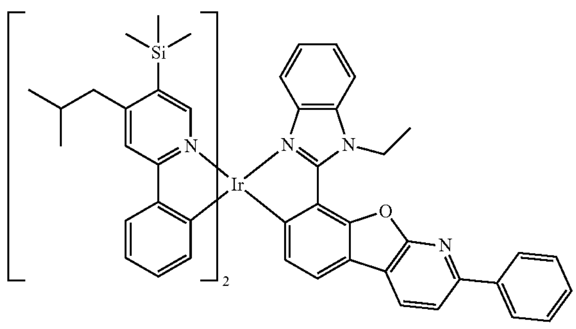
44
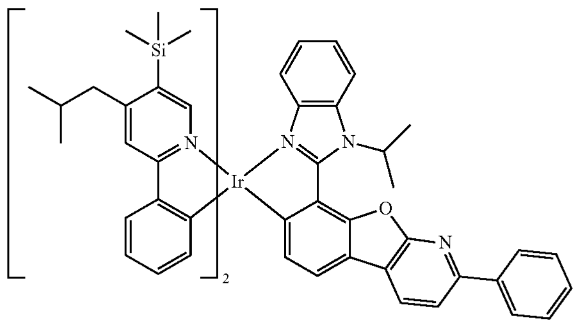
45
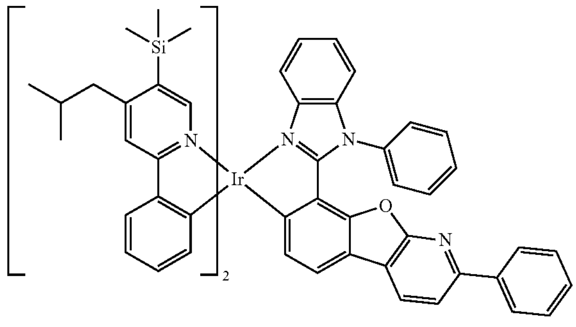
-continued
46
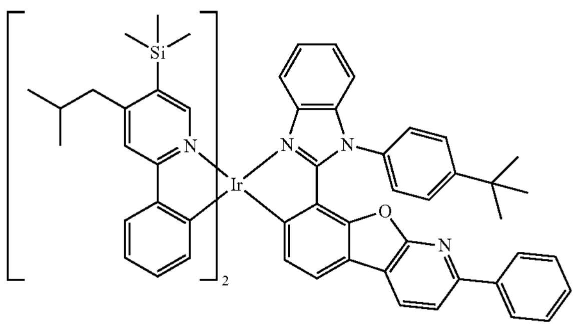
47
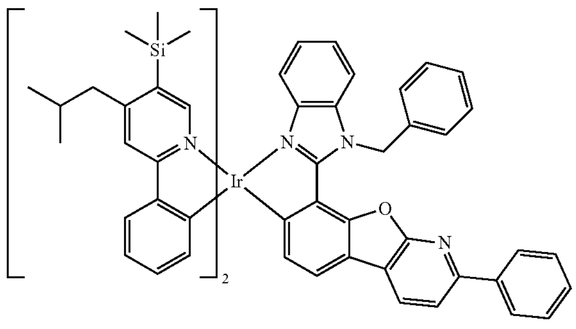
48
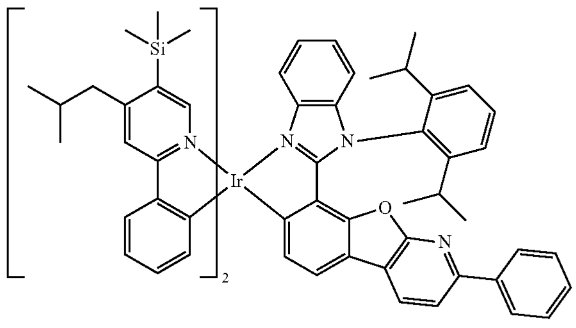
49
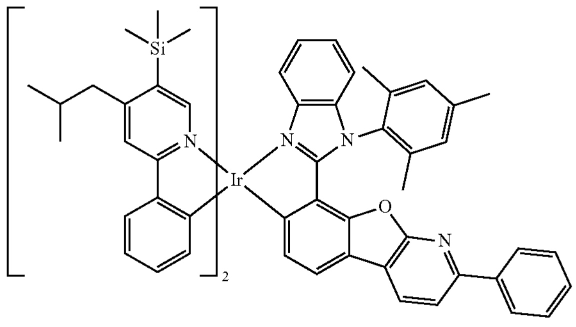

-continued
50
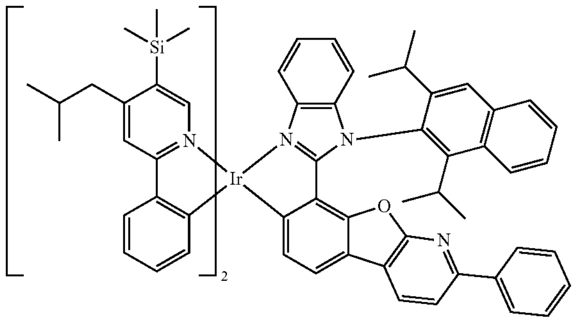
51
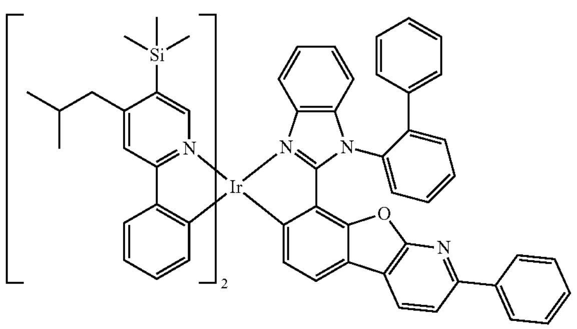
52
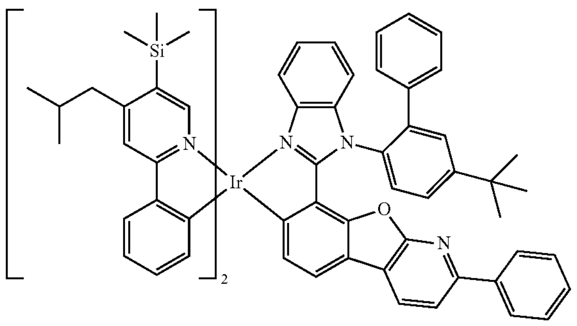
53
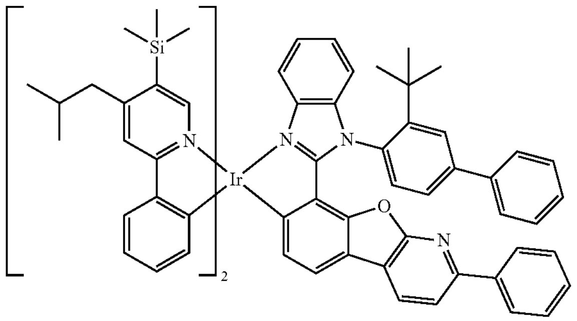
-continued
54
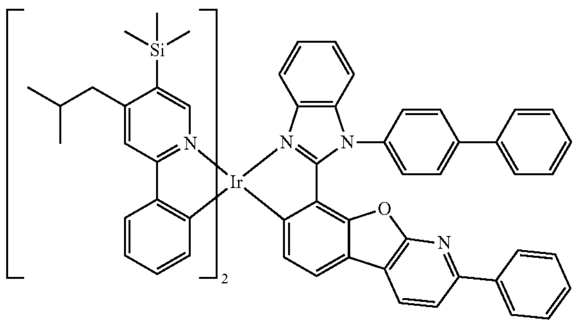
55
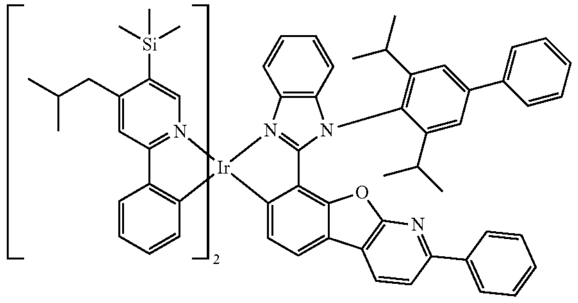
56
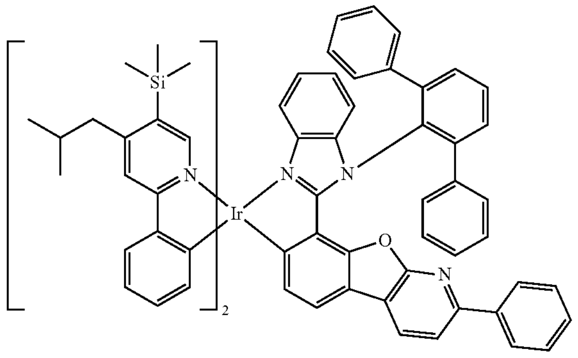
57
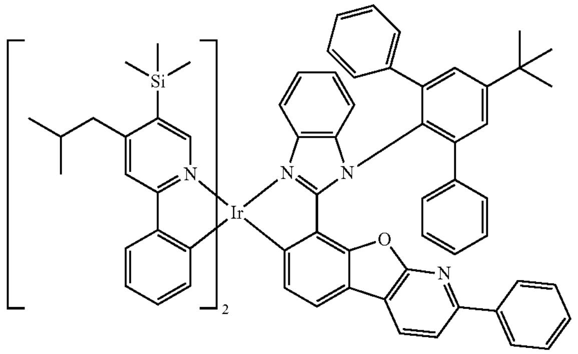

58
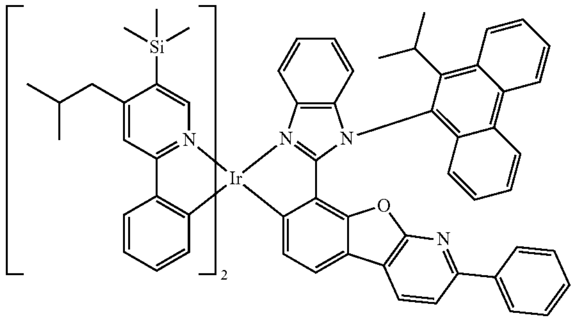
59
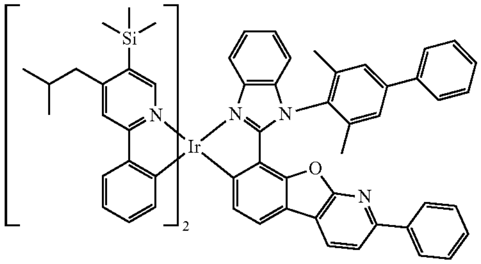
60
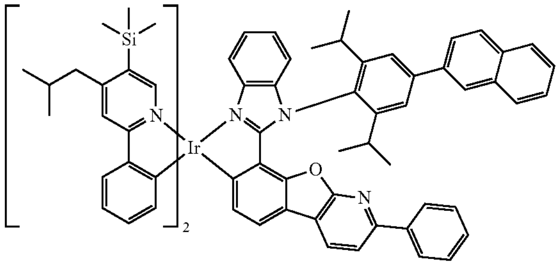
61
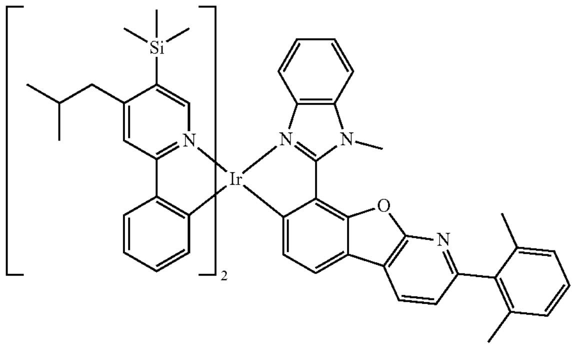
62
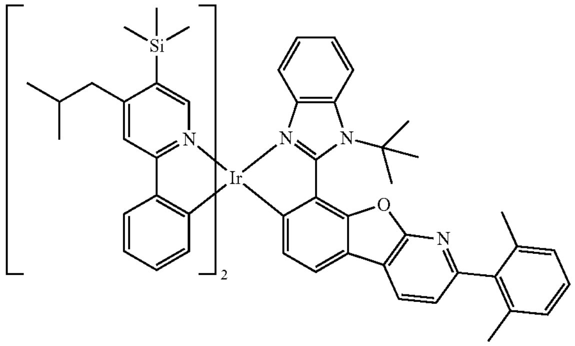
63
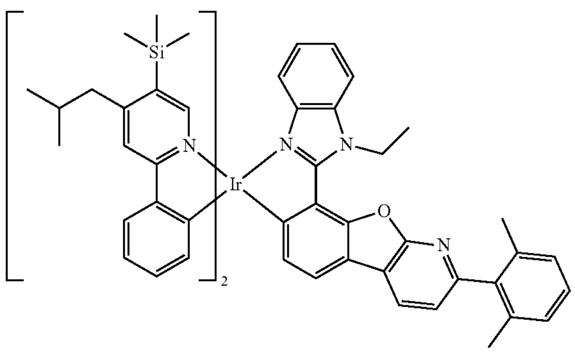
64
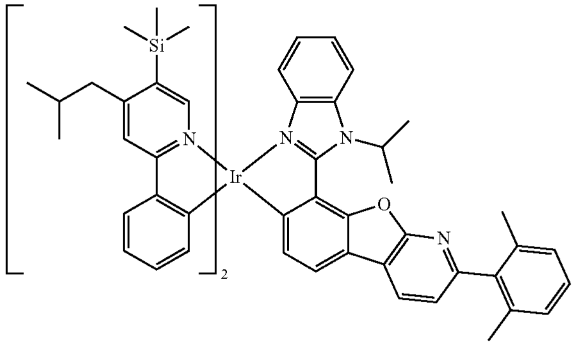
65
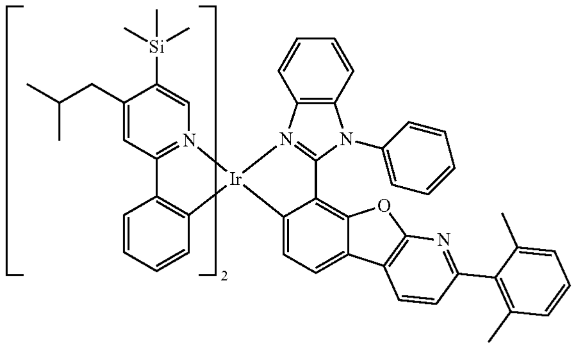
66
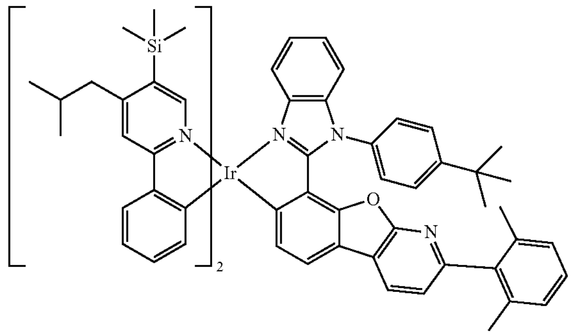

-continued
67
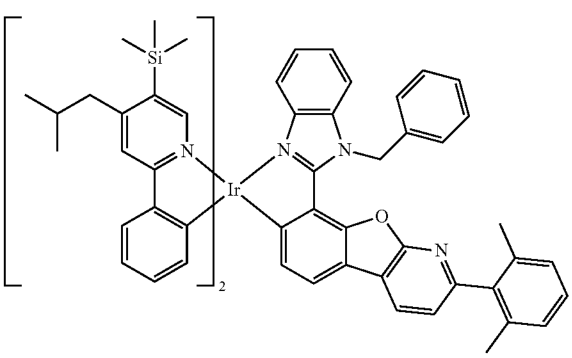
68
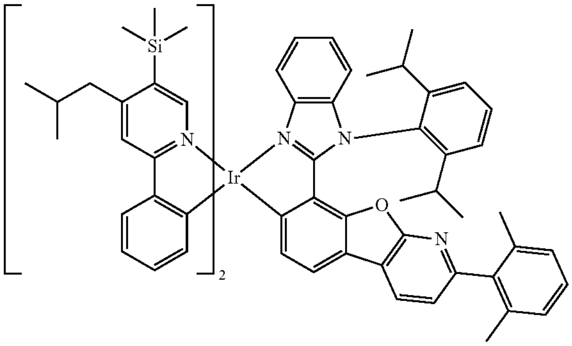
69
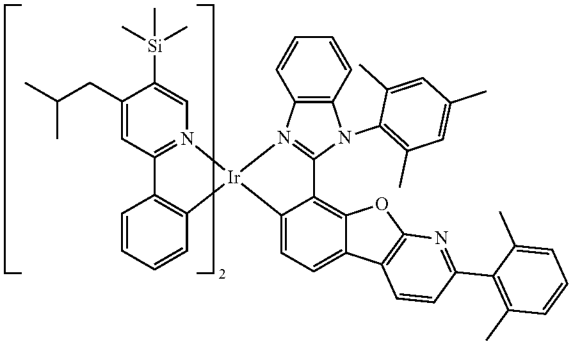
70
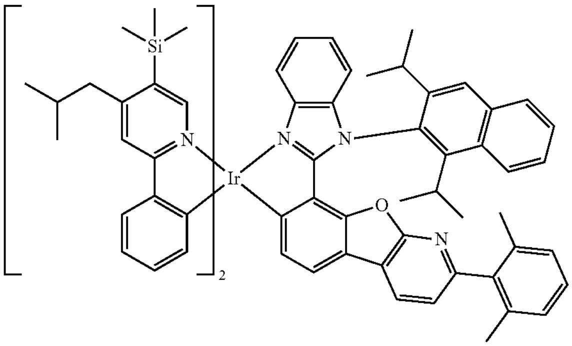
71
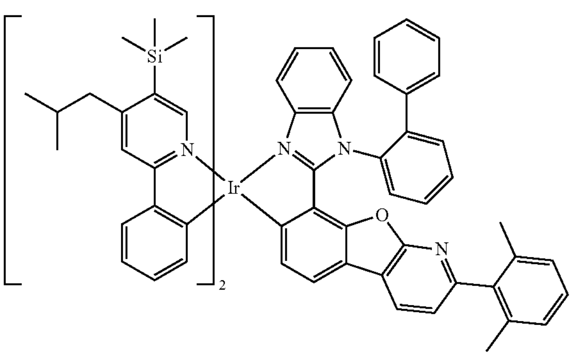
72
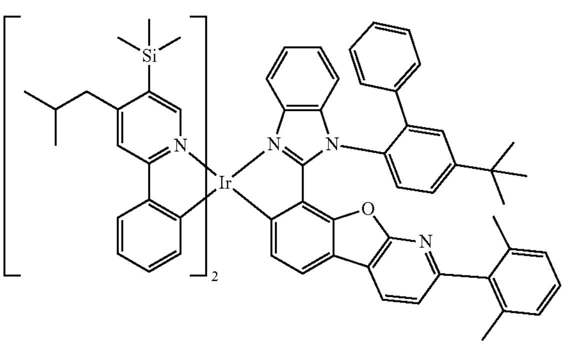
73
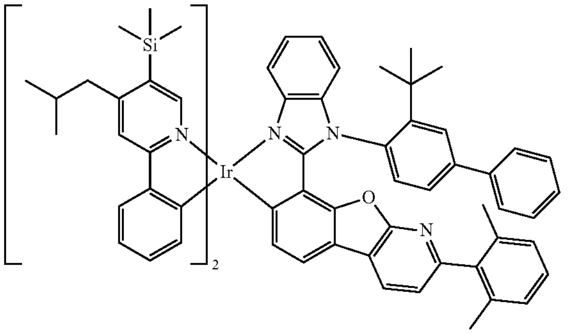
74
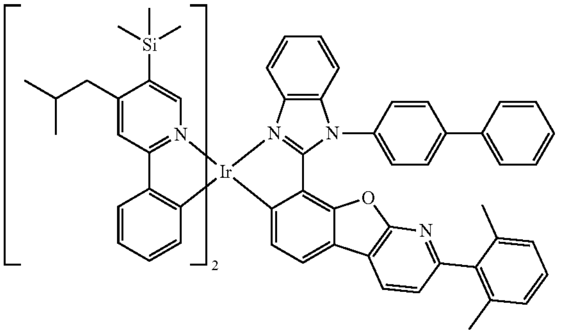

-continued
75
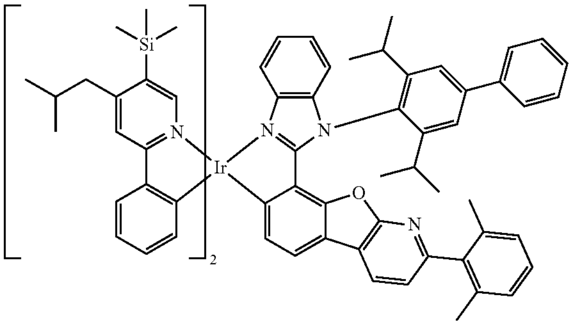
76
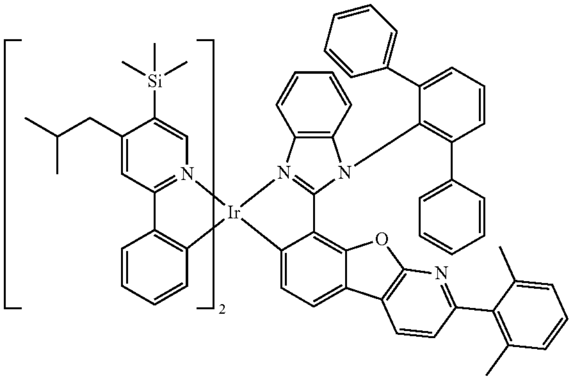
77
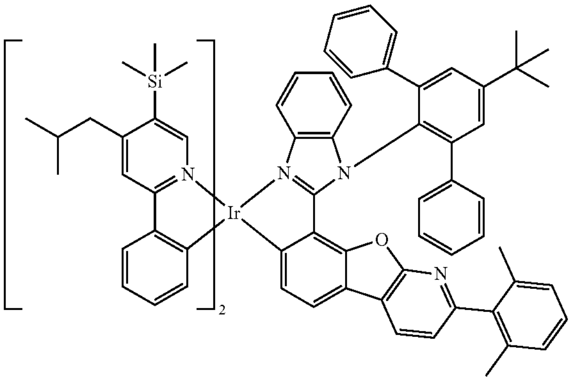
78
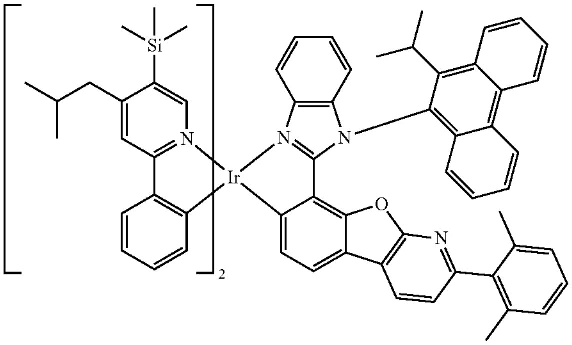
-continued
79
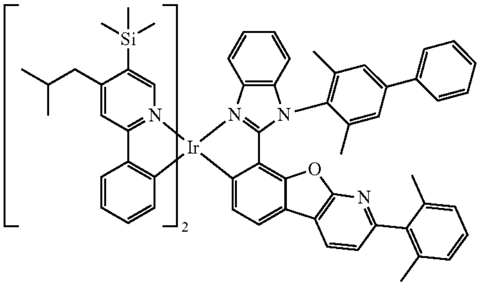
80
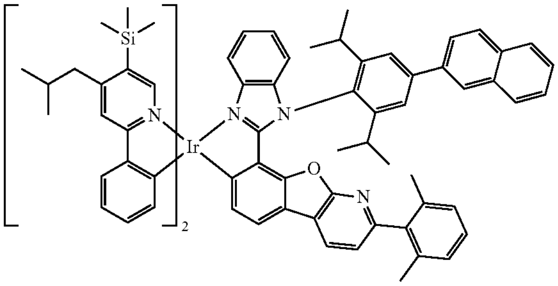
81
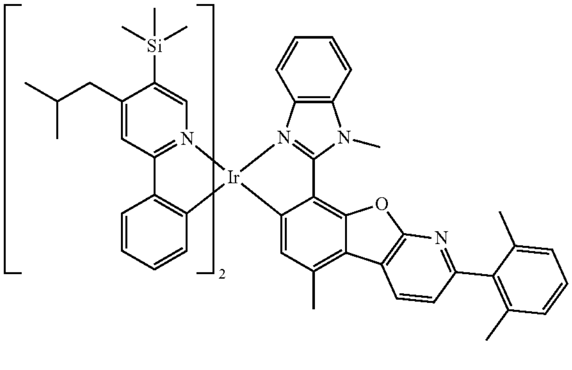
82
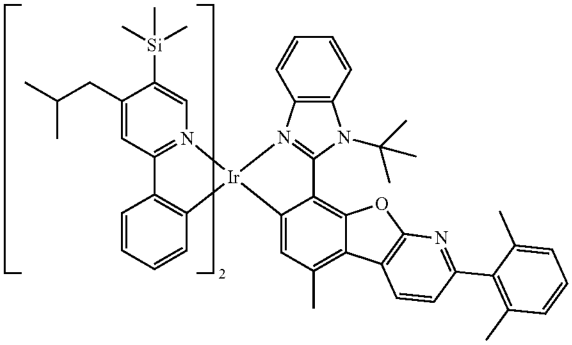

83
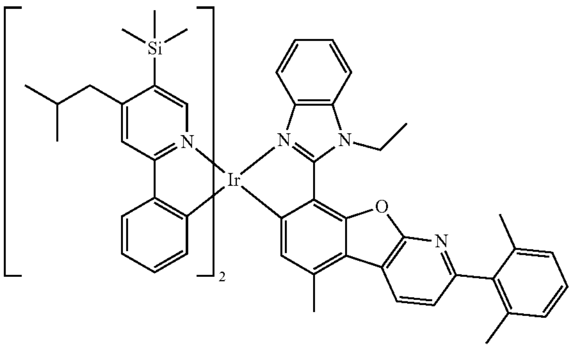
84
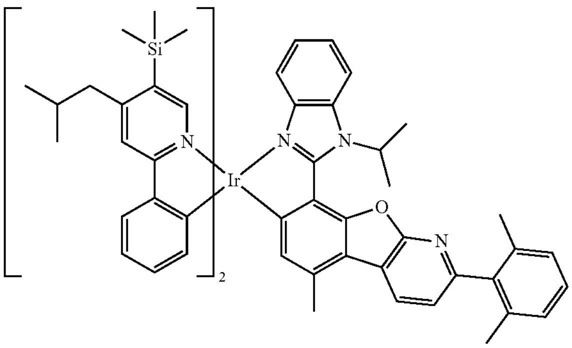
85
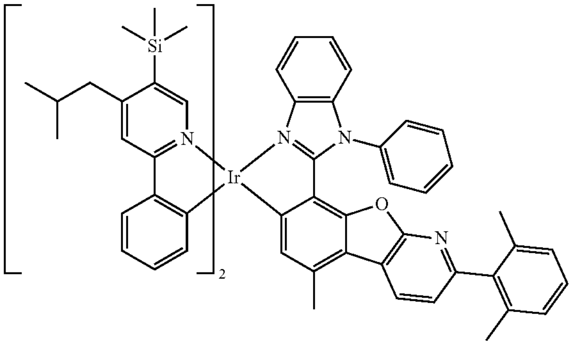
86
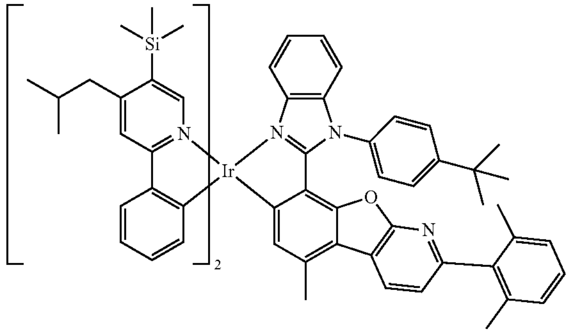
87
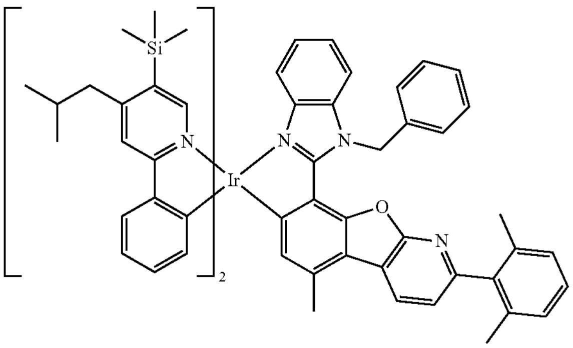
88
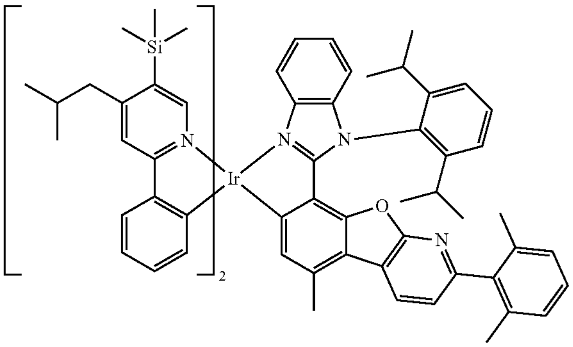
89
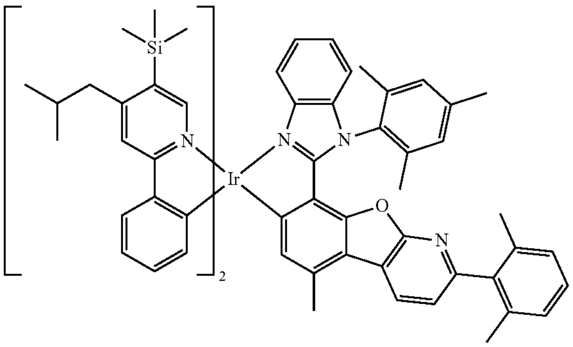
90
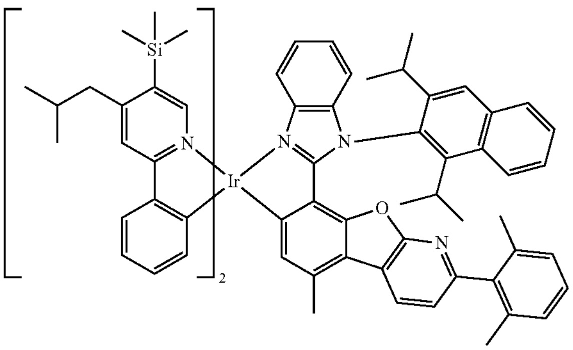

-continued
91
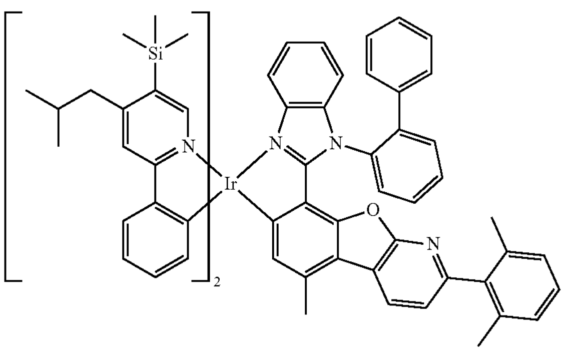
92
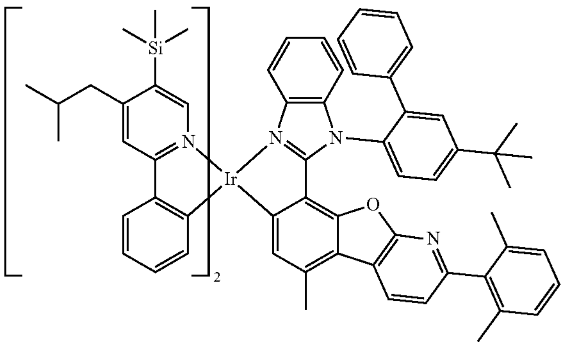
93
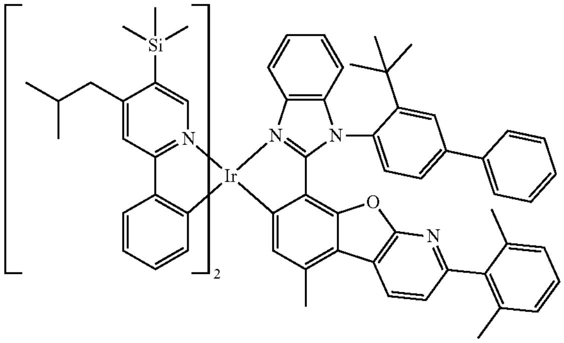
94
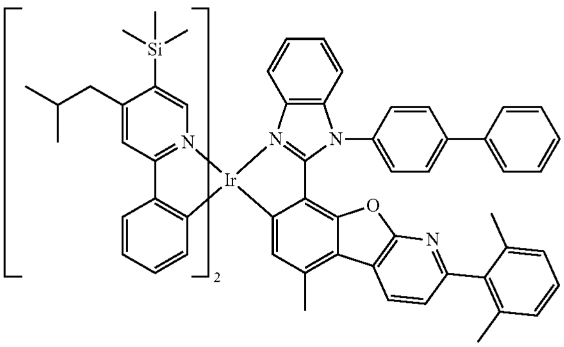
95
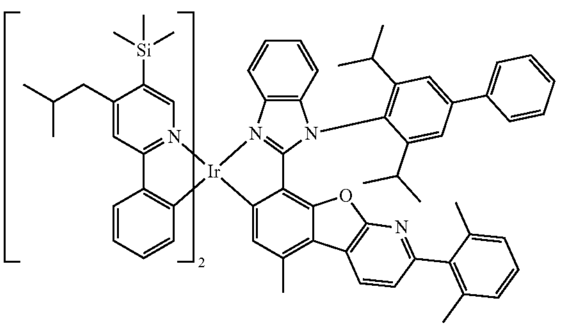
96
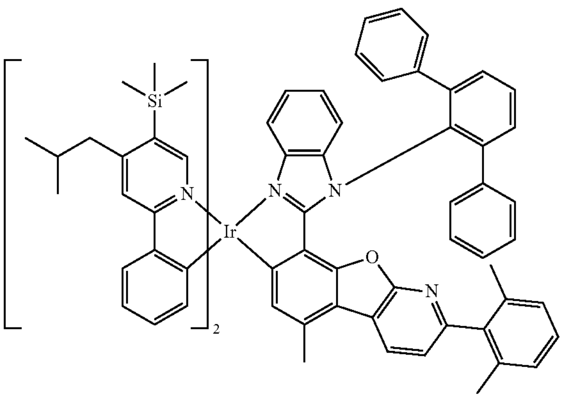
97
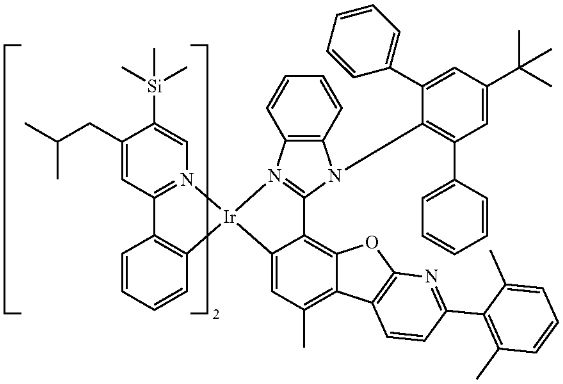
98
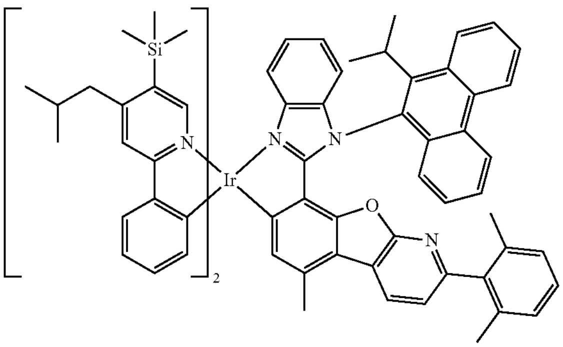

99
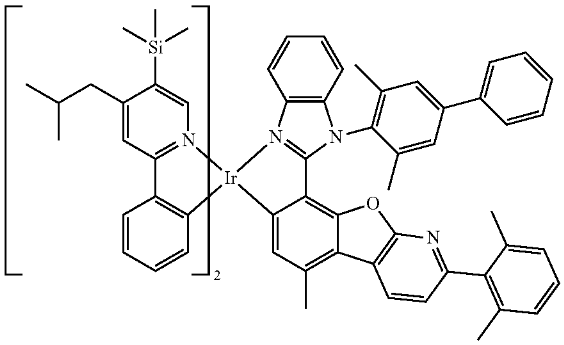
100
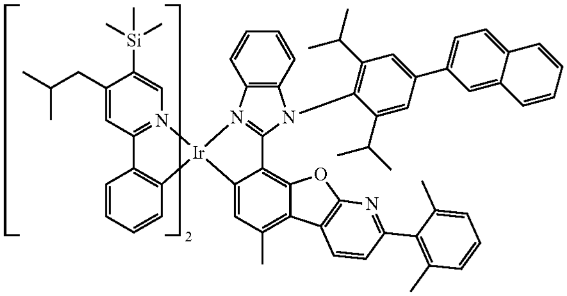
101
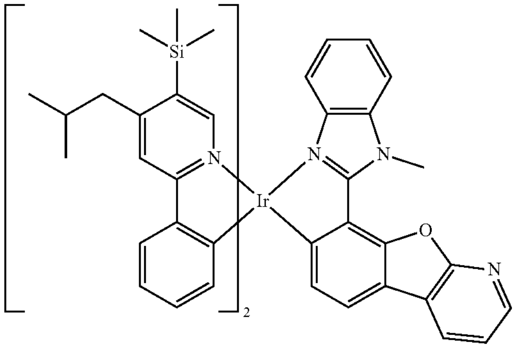
102
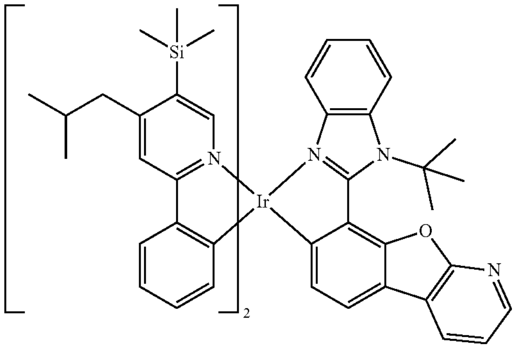
103
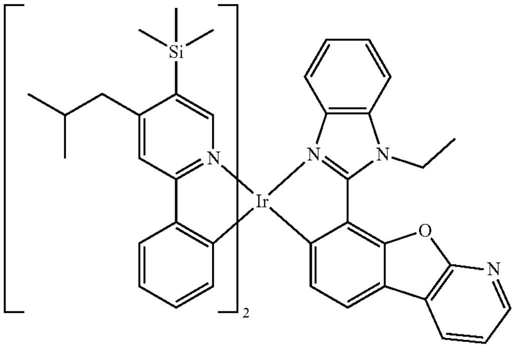
104
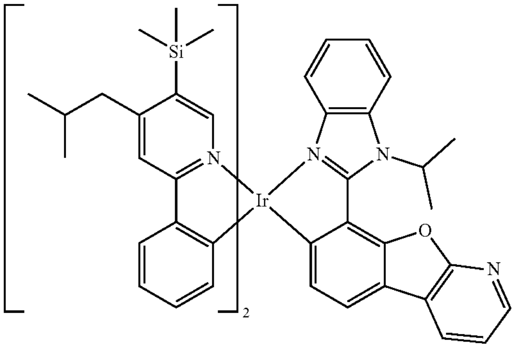
105
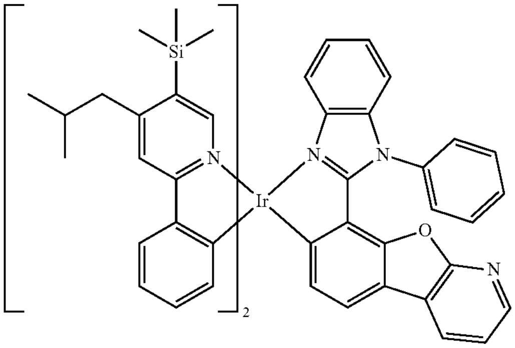
106
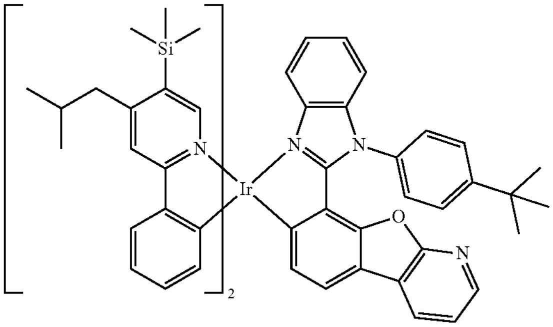

-continued
107
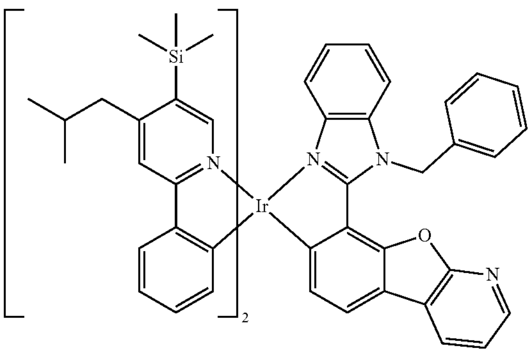
108
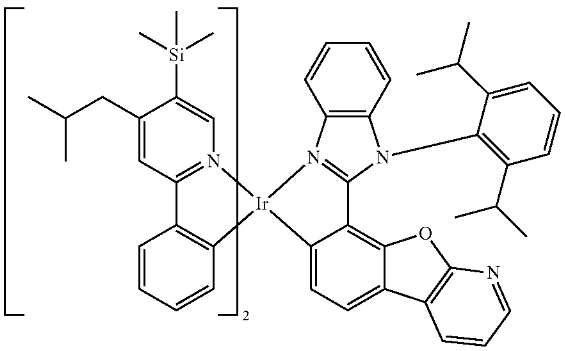
109
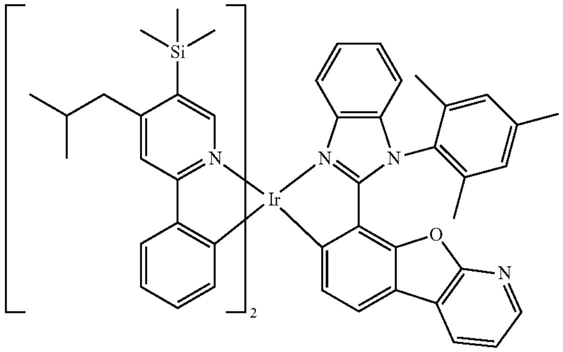
110
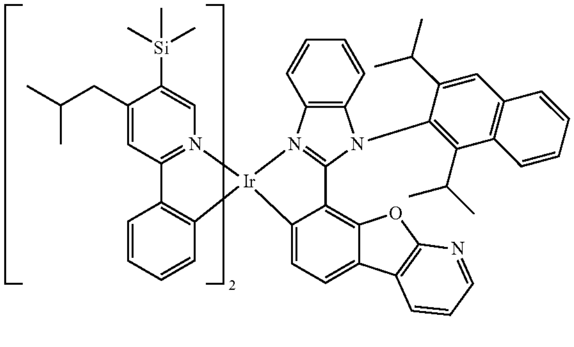
-continued
111
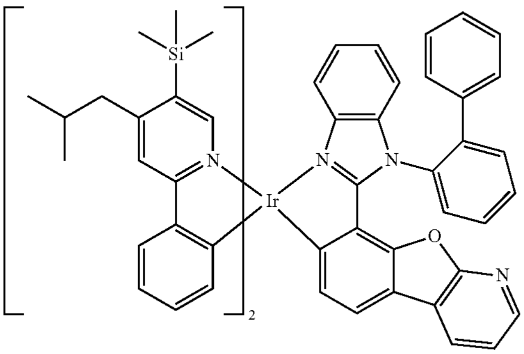
112
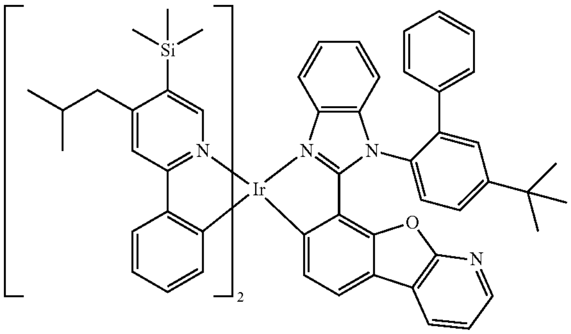
113
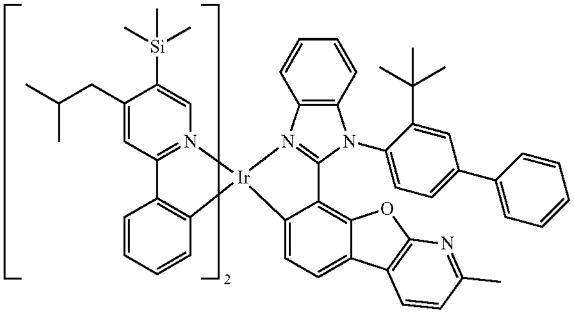
114
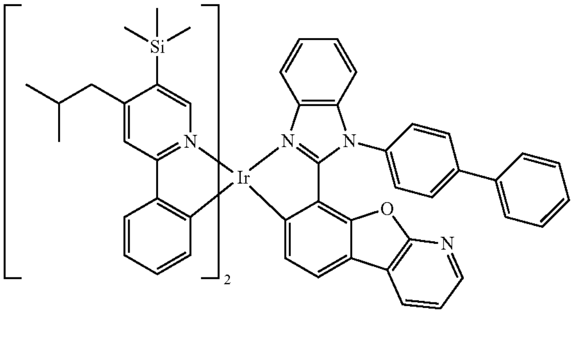

-continued
115
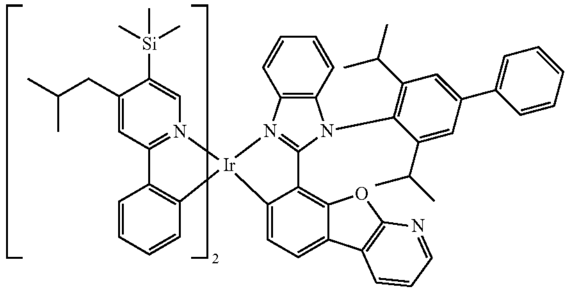
116
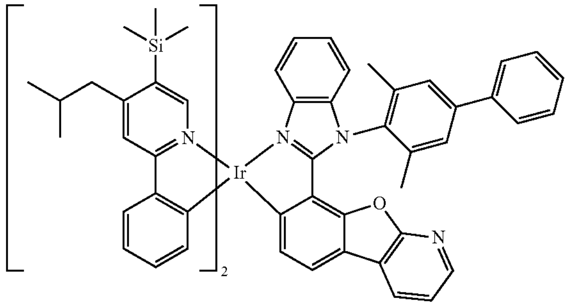
117
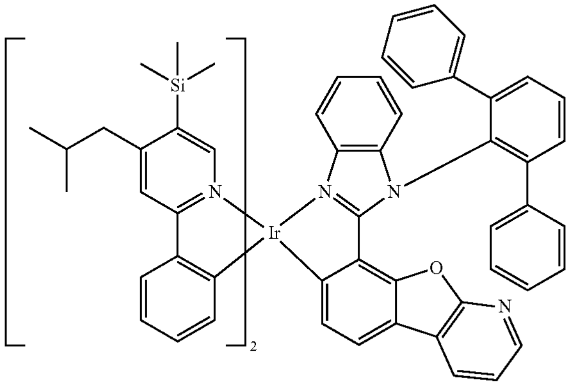
118
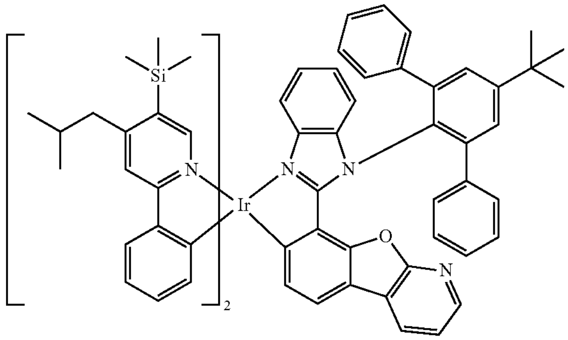
-continued
119
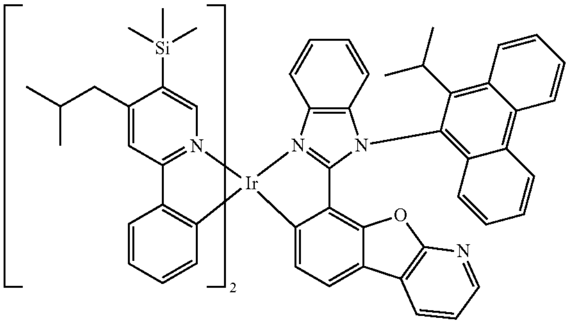
120
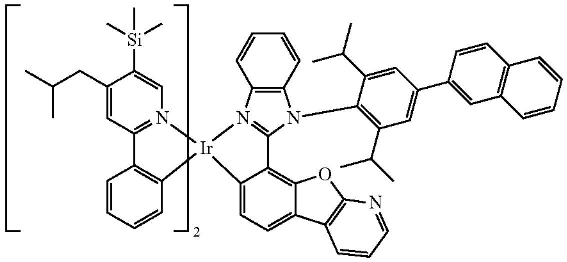
121
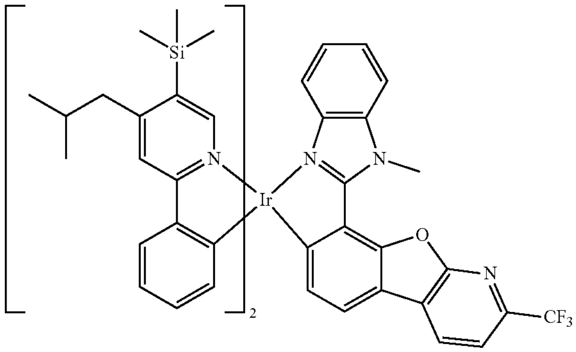
122
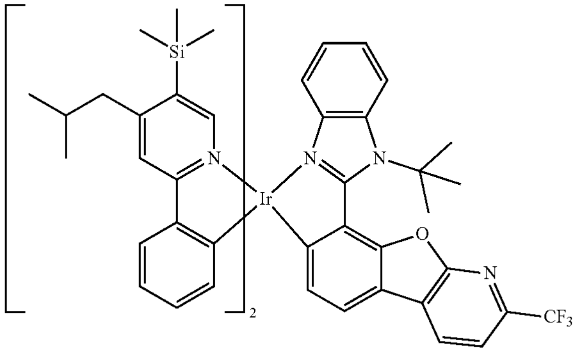

123
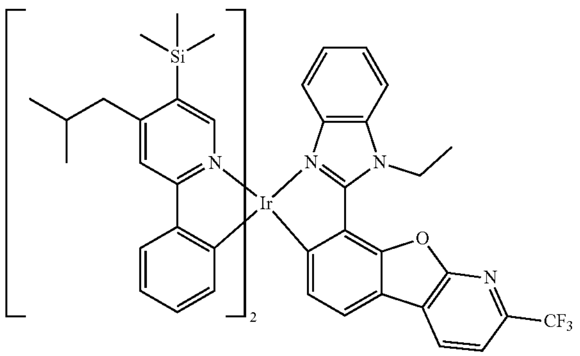
124
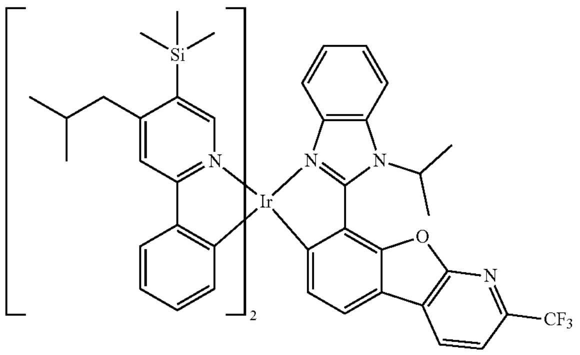
125
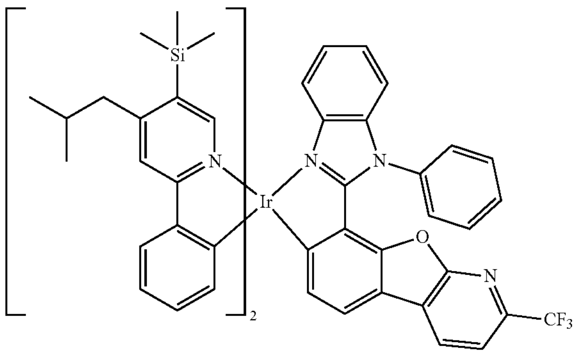
126
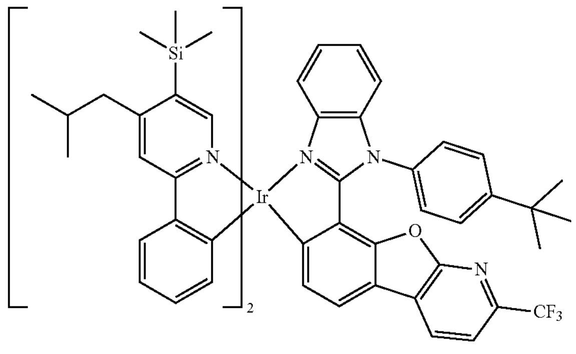
127
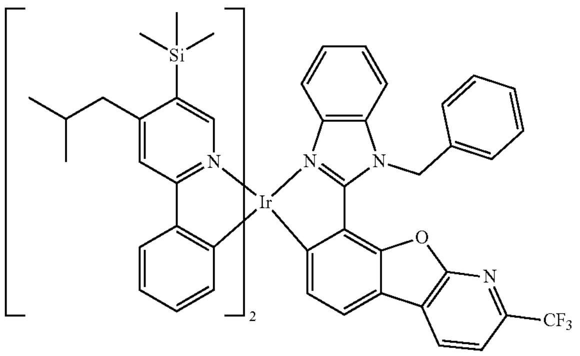
128
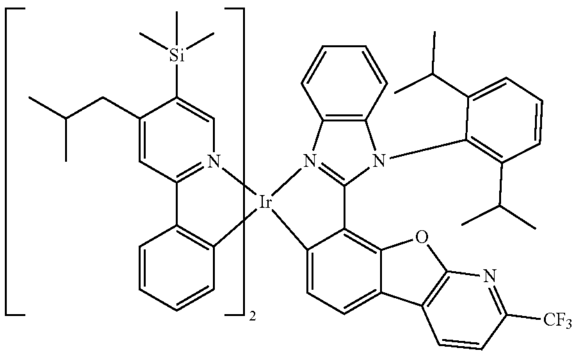
129
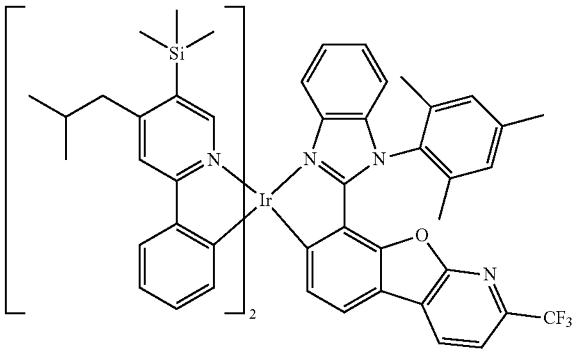
130
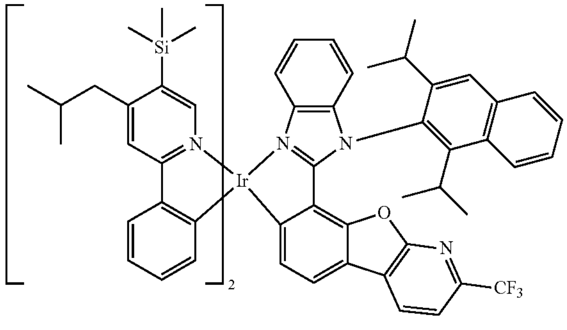

131
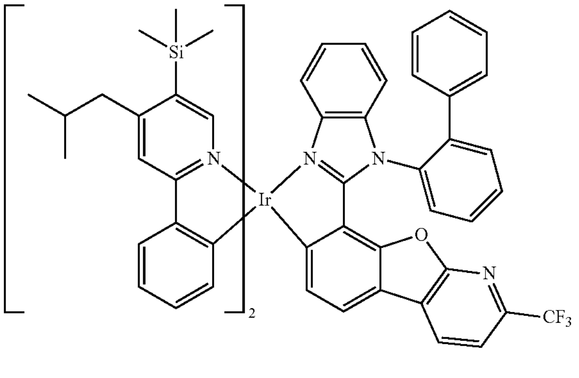
132
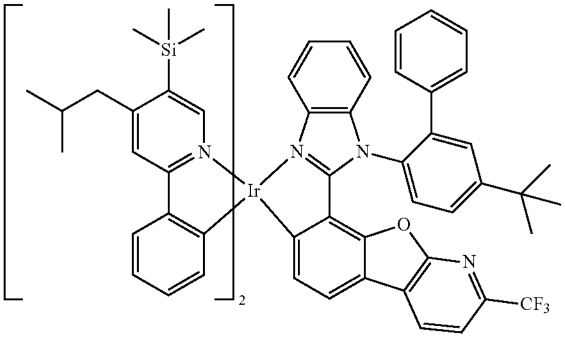
133
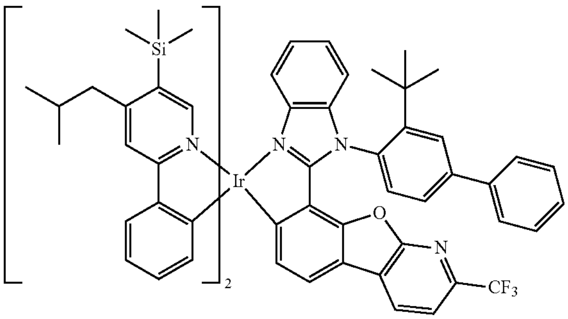
134
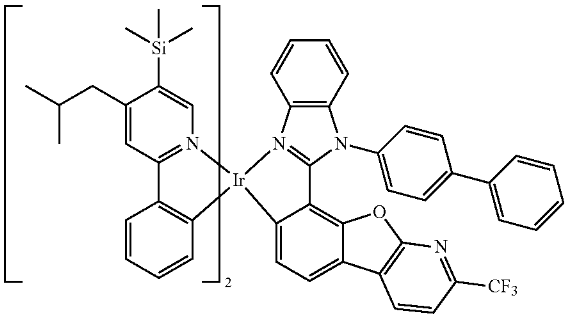
135
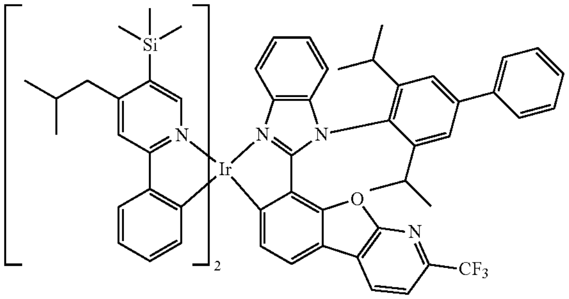
136
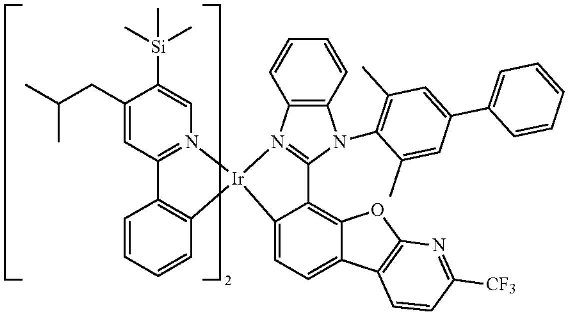
137
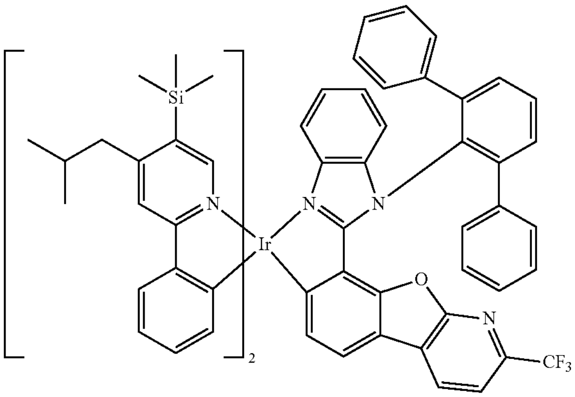
138
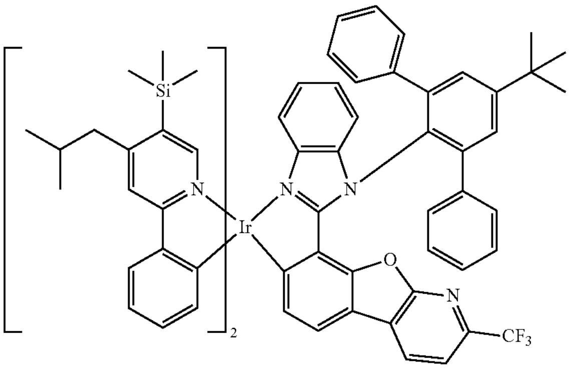

-continued
139
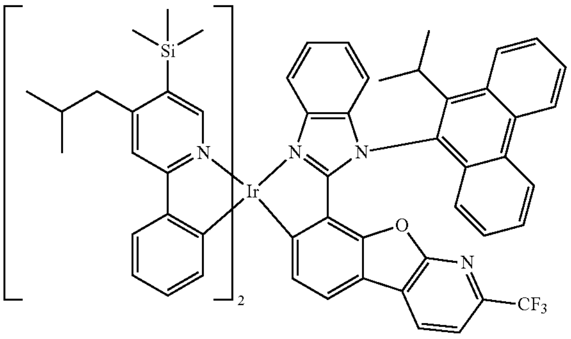
140
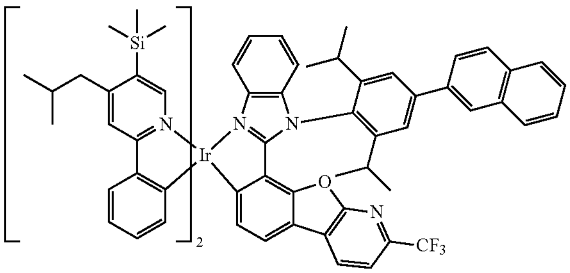
141
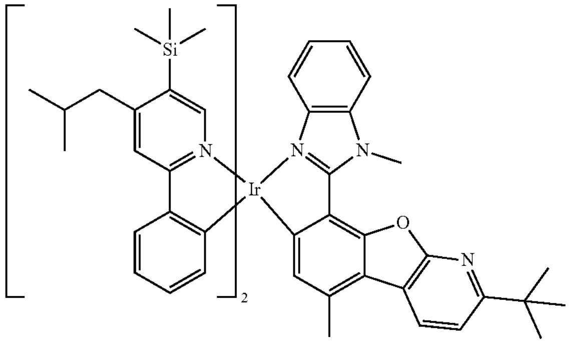
142
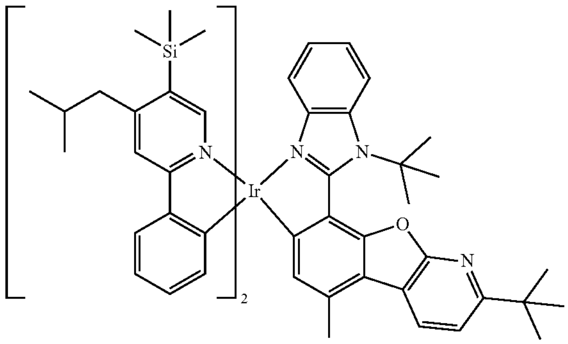
-continued
143
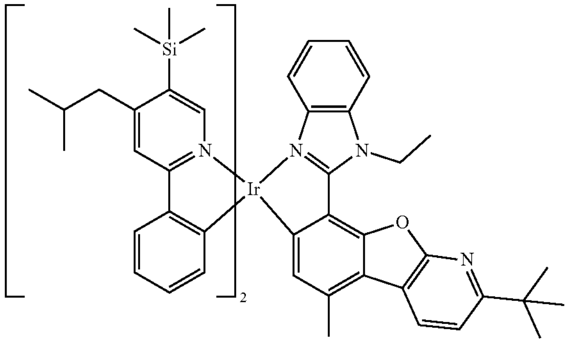
144
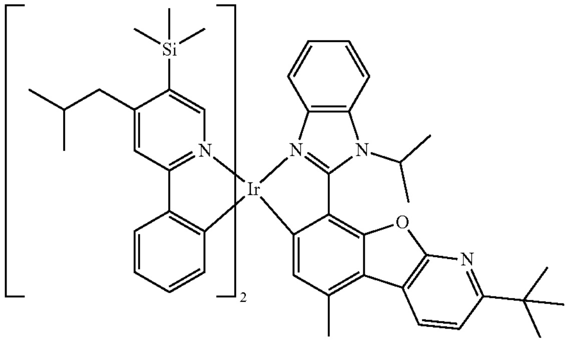
145
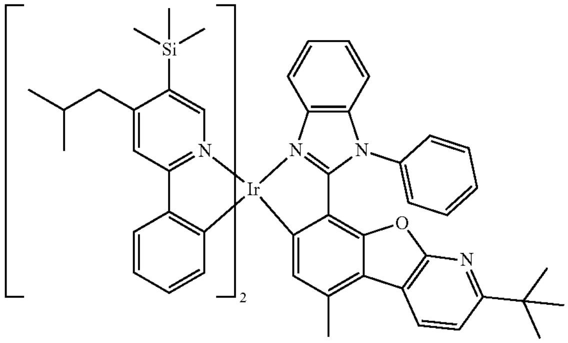
146
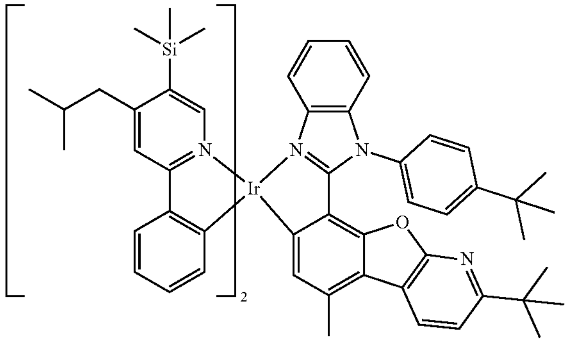

-continued
147
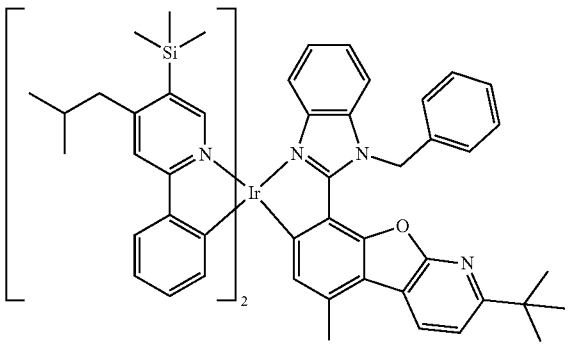
148
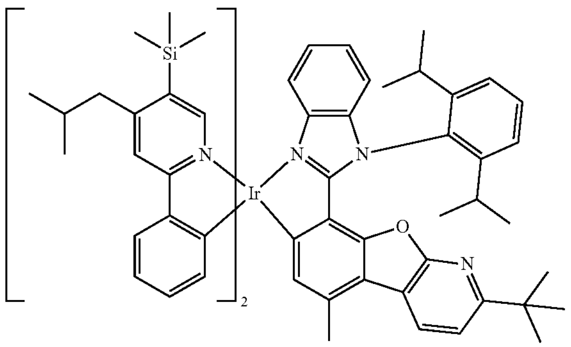
149
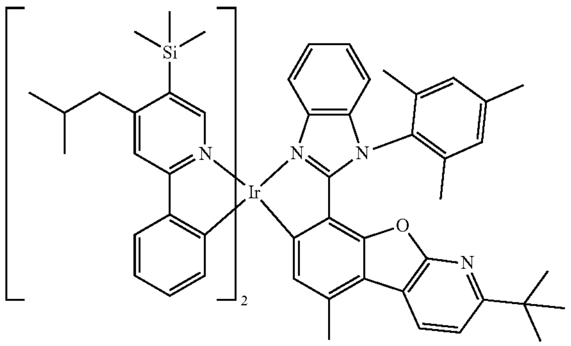
150
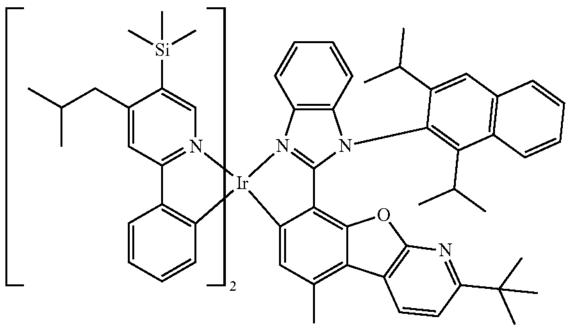
-continued
151
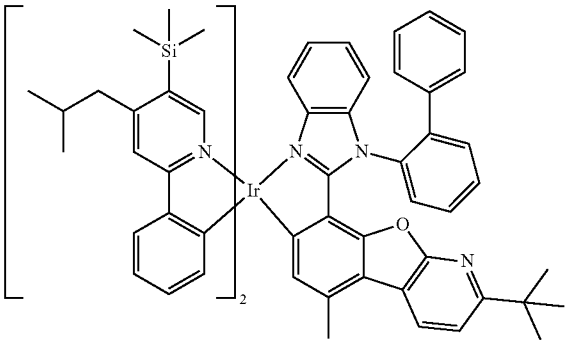
152
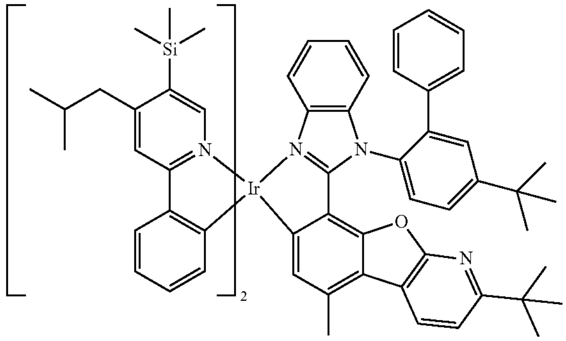
153
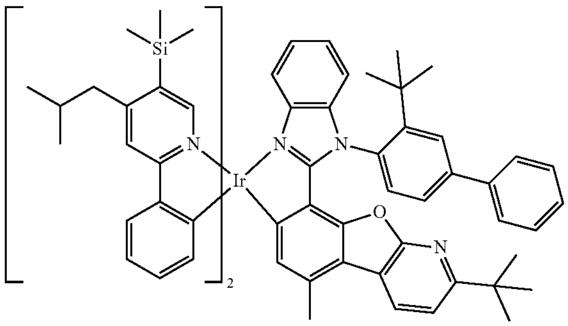
154
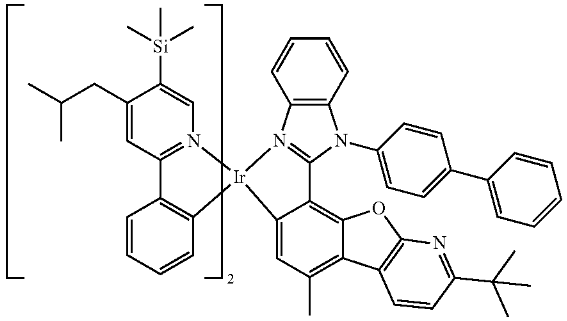

-continued
155
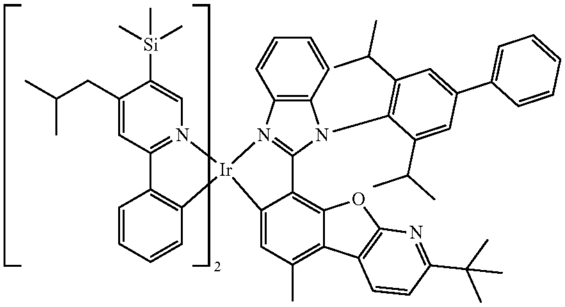
156
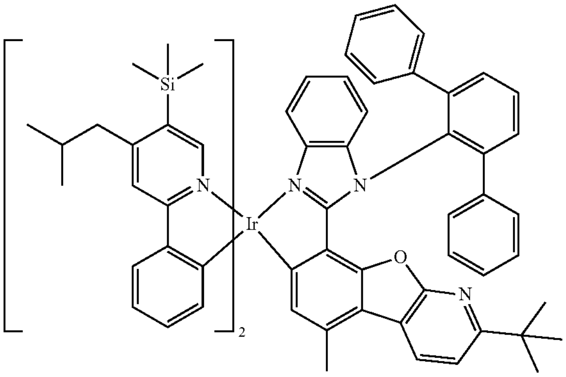
157
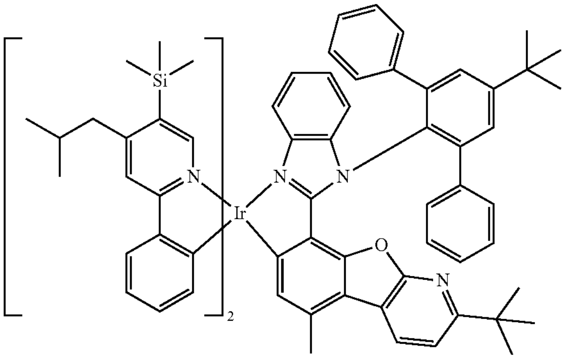
158
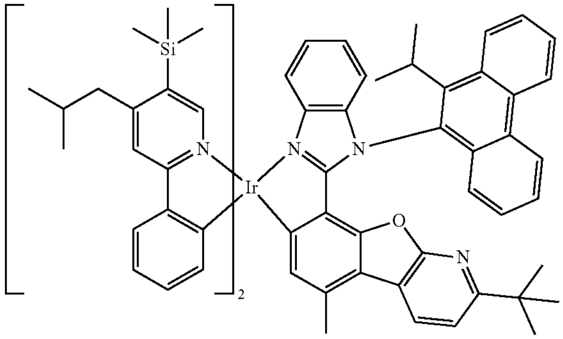
-continued
159
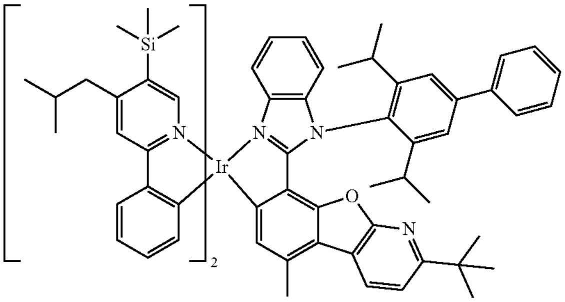
160
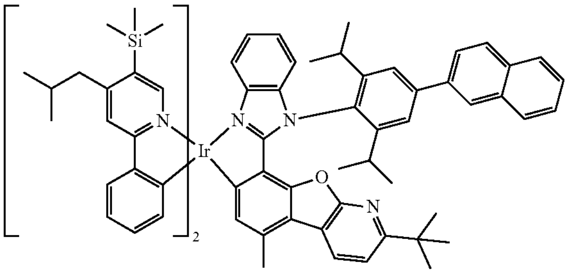
161
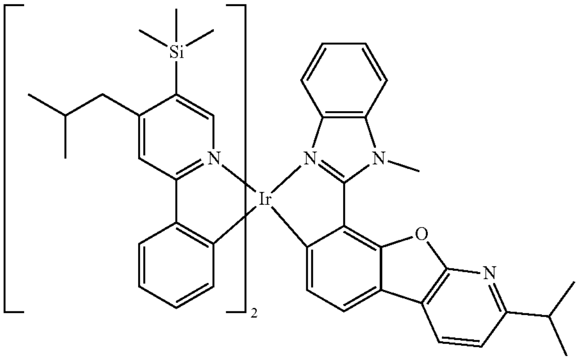
162
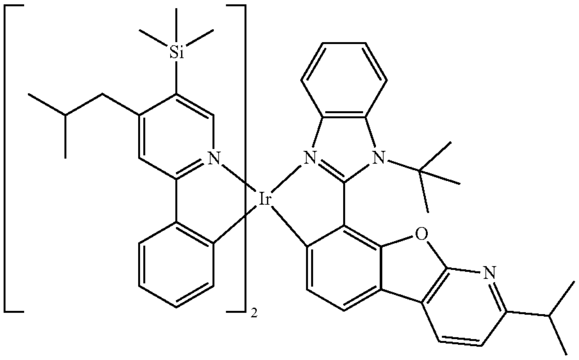

-continued
163
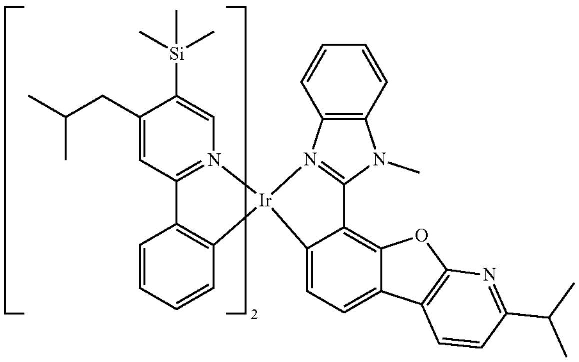
164
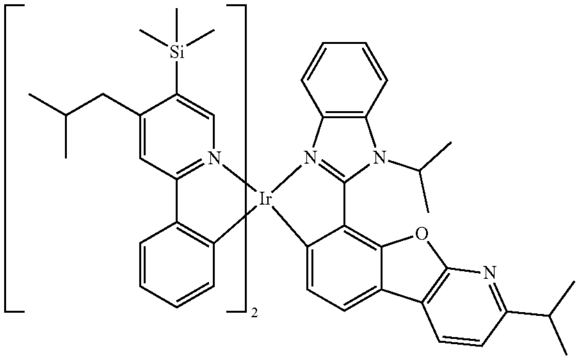
165
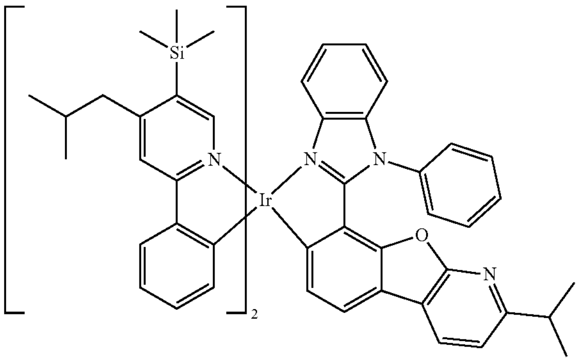
166
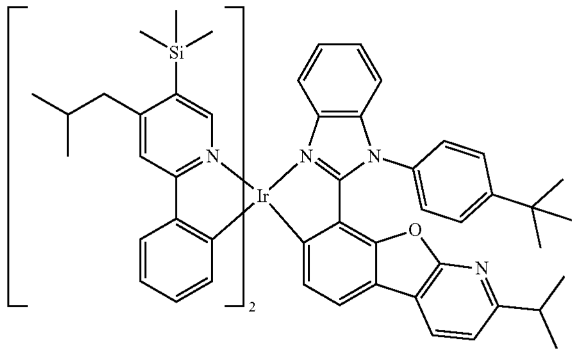
-continued
167
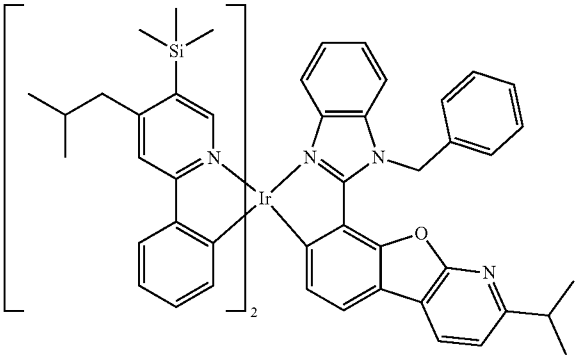
168
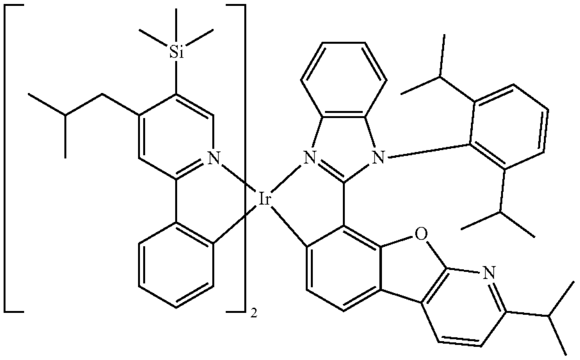
169
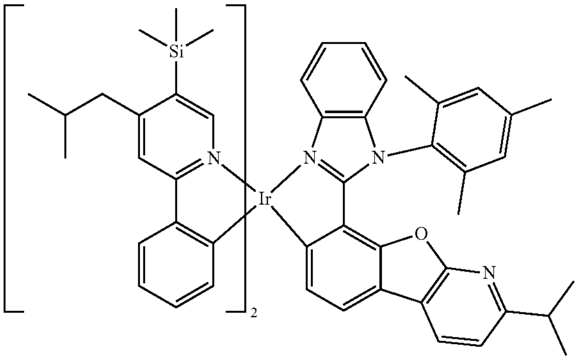
170
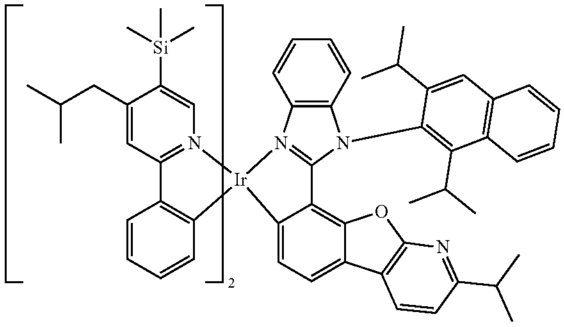

171
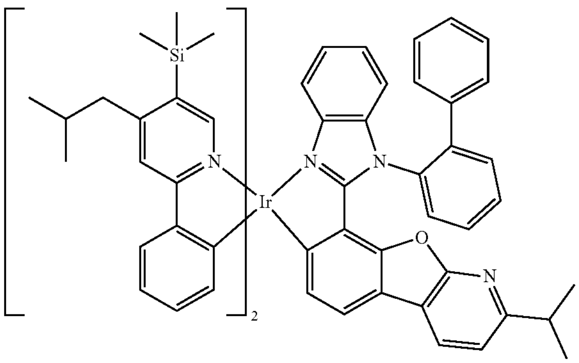
172
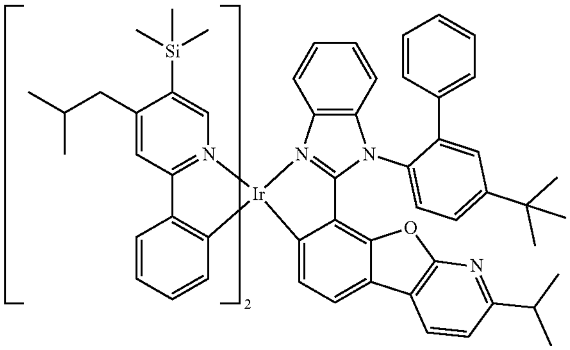
173
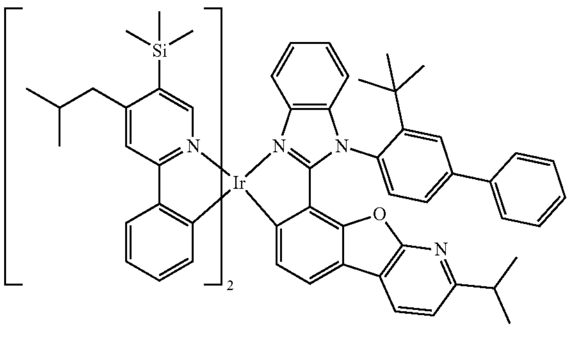
174
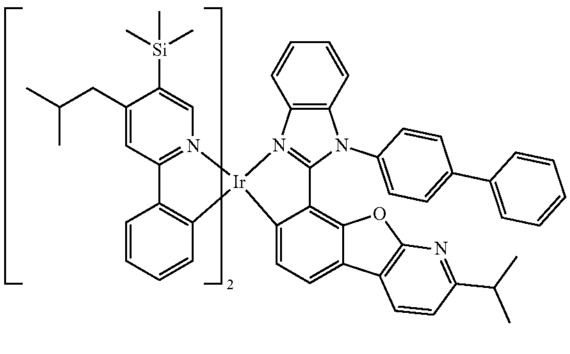
175
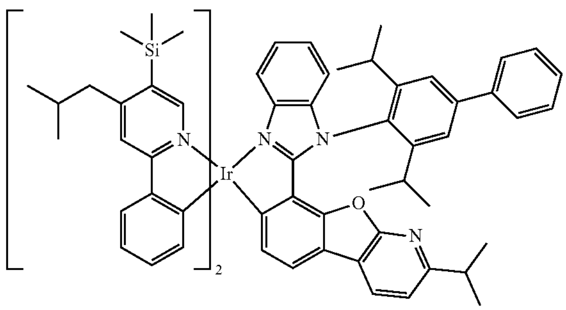
176
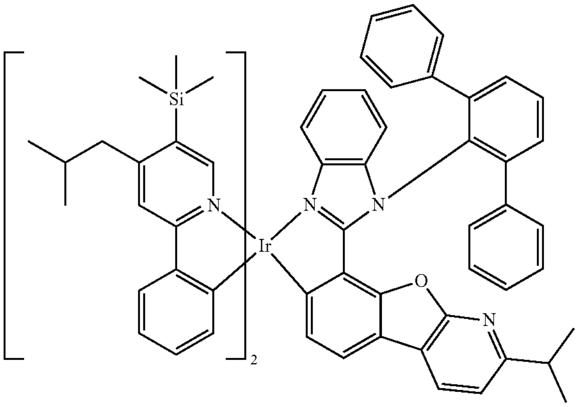
177
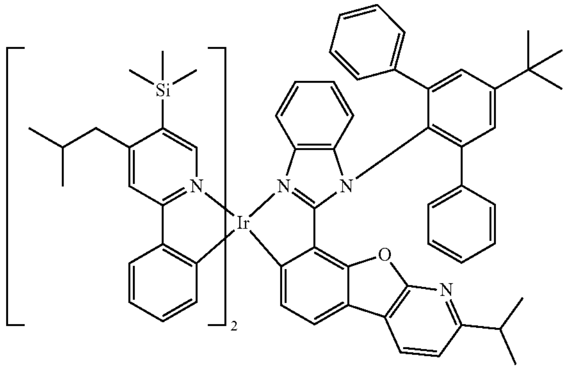
178
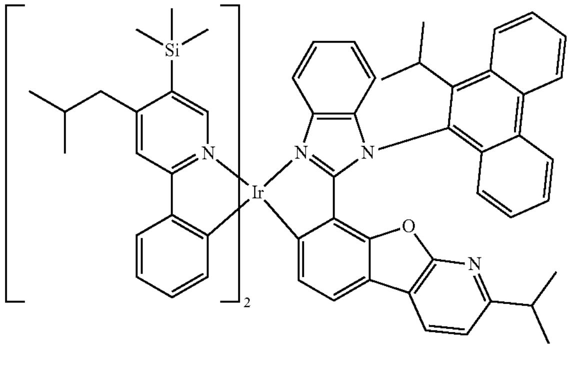

-continued
179
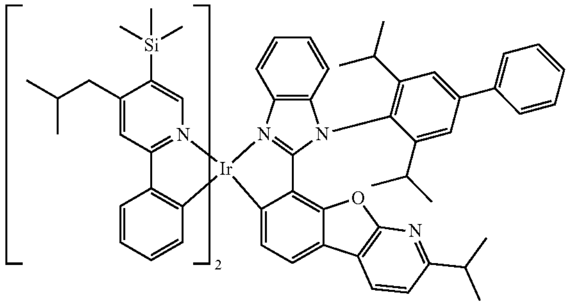
180
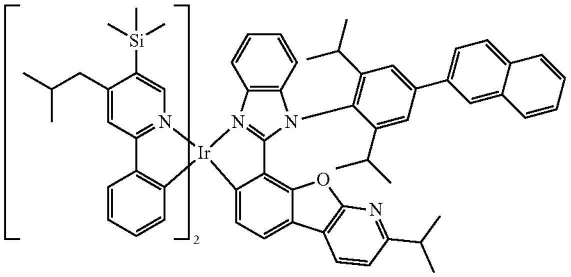
181
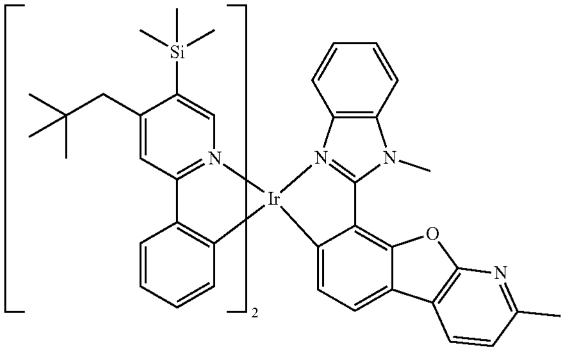
182
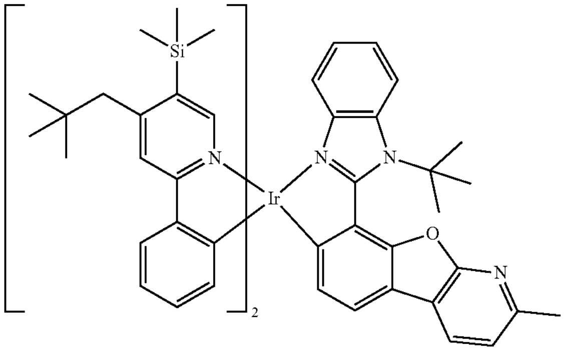
-continued
183
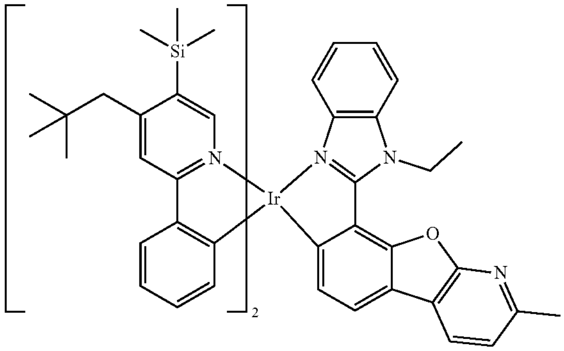
184
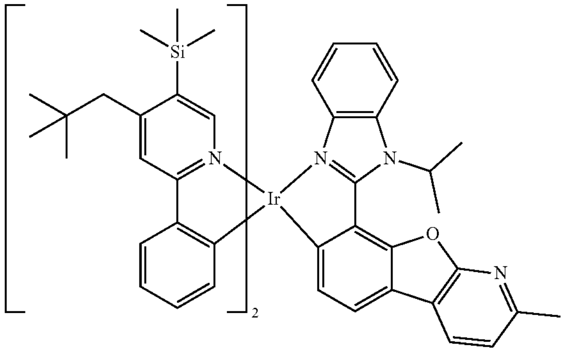
185
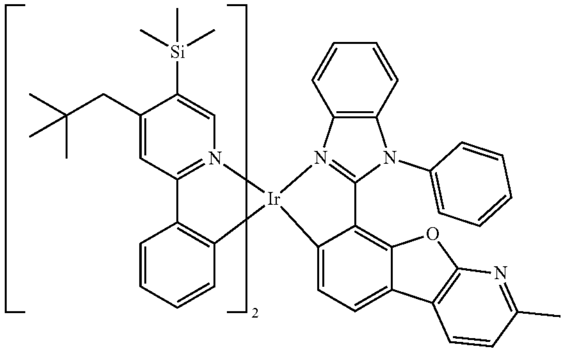
186
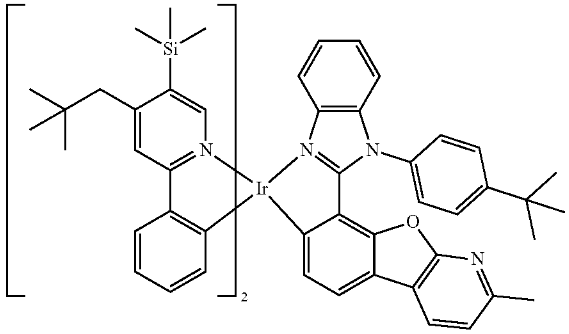

-continued
187
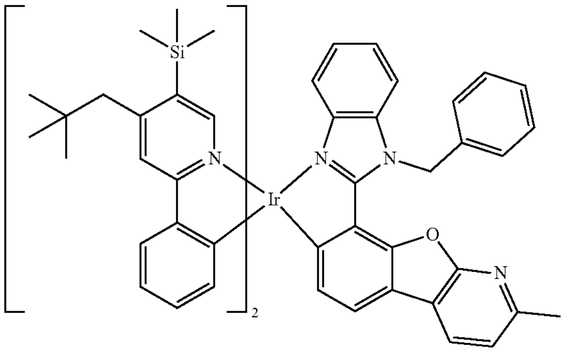
188
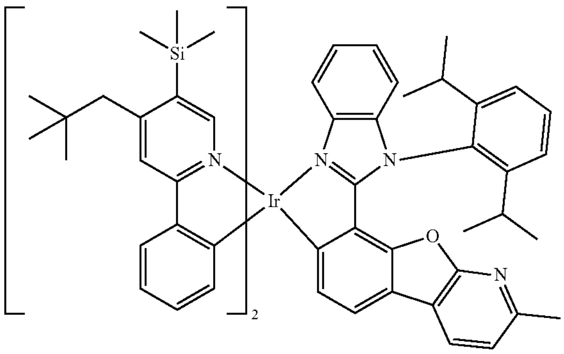
189
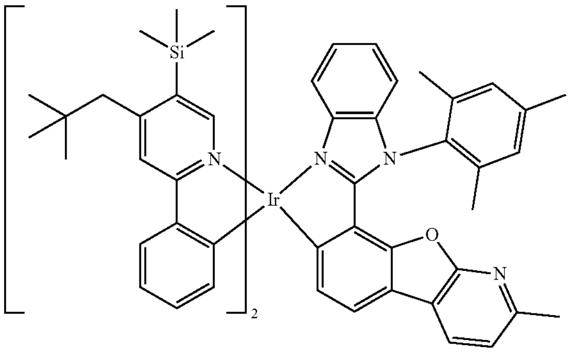
190
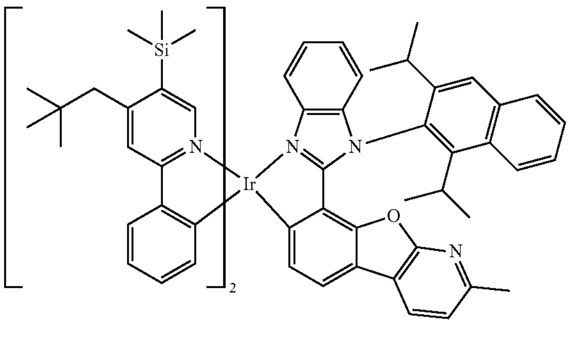
-continued
191
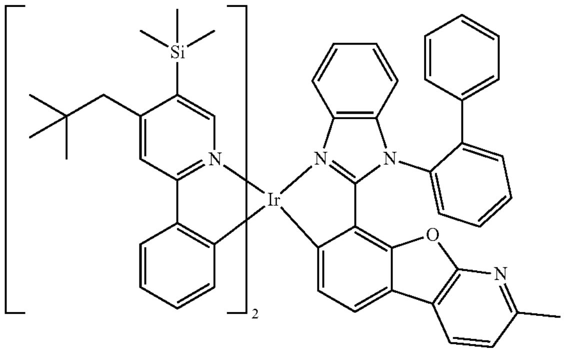
192
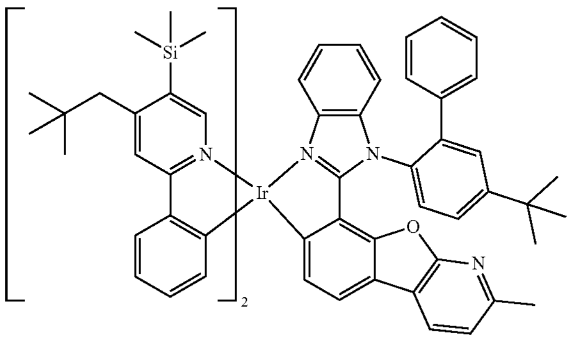
193
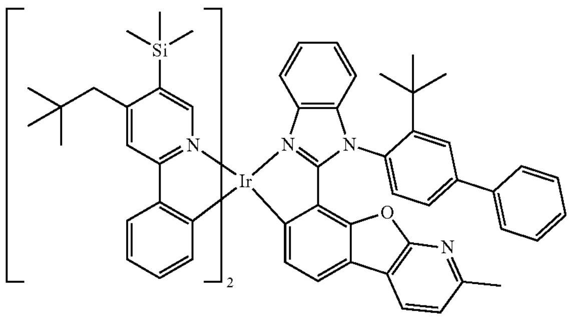
194
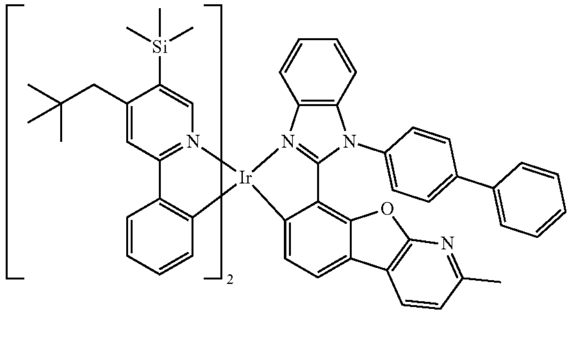

-continued
195
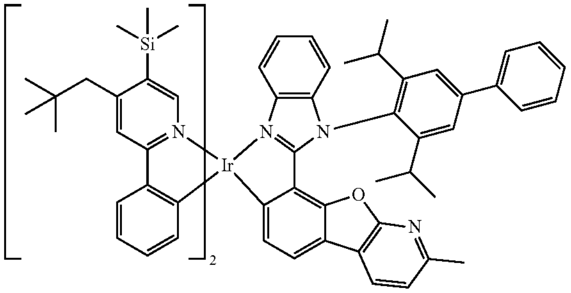
196
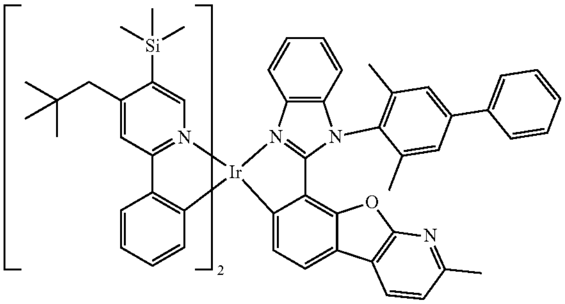
197
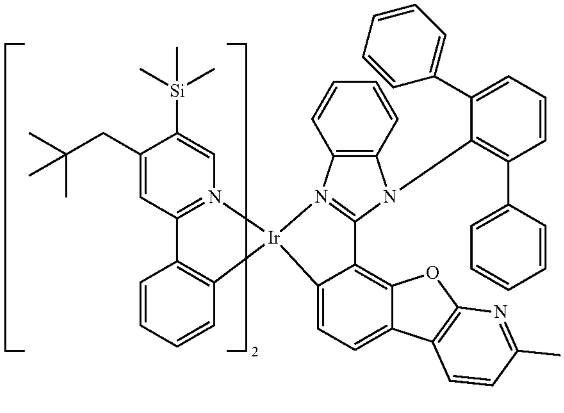
198
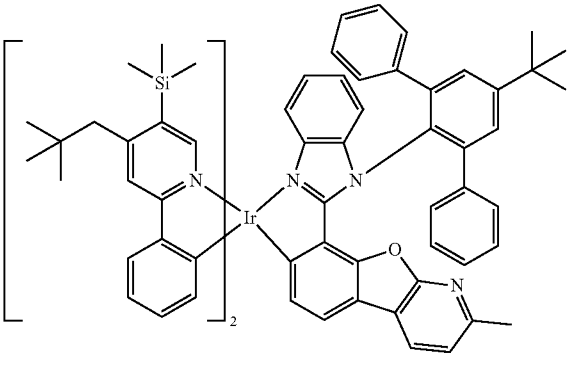
199
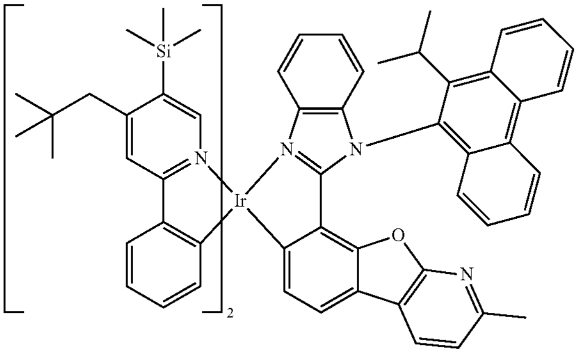
200
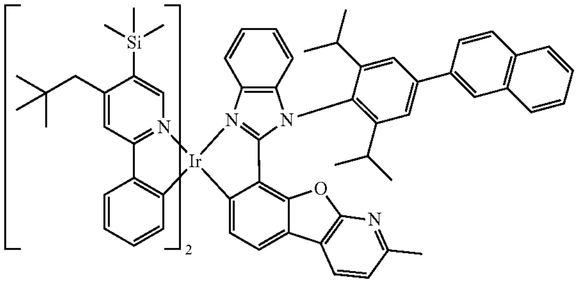
201
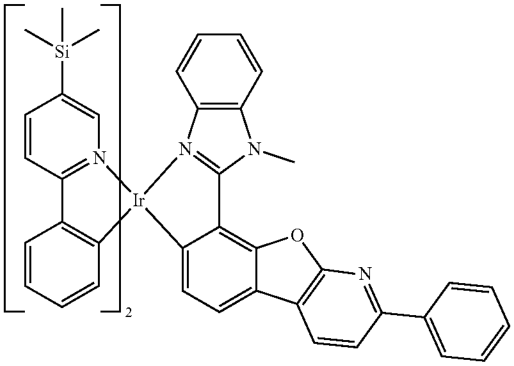
202
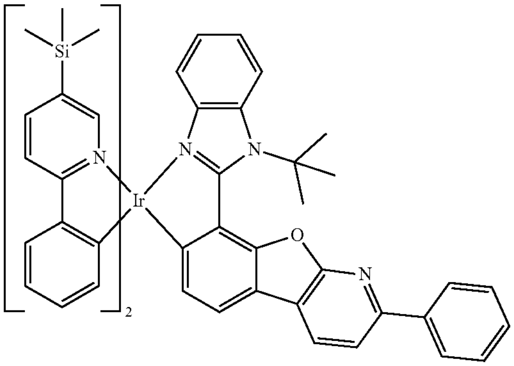

-continued
203
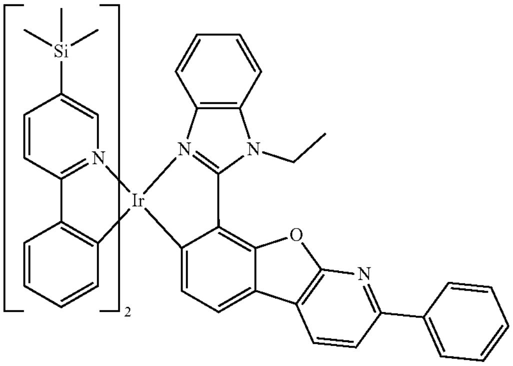
204
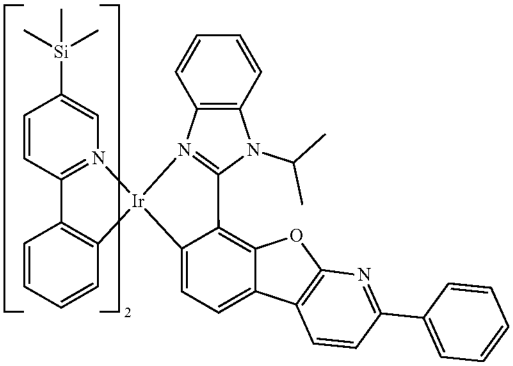
205
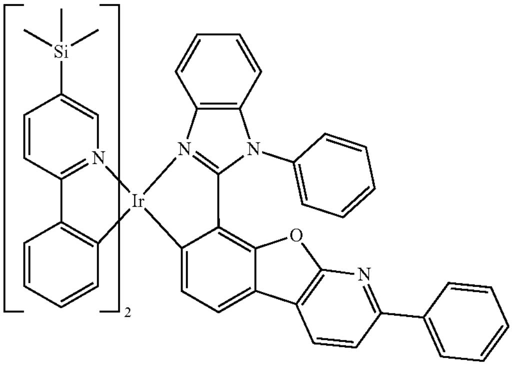
206
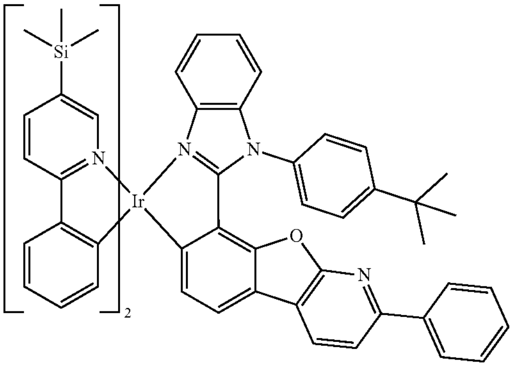
-continued
207
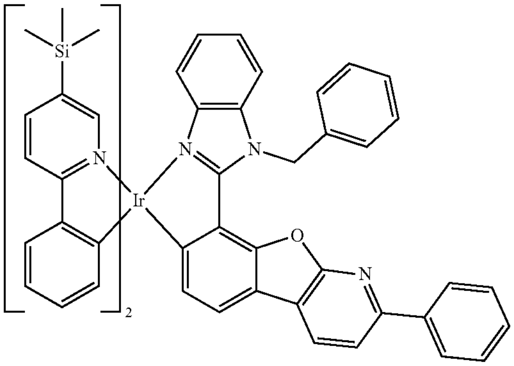
208
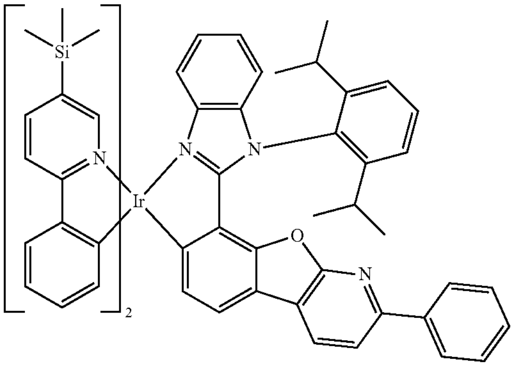
209
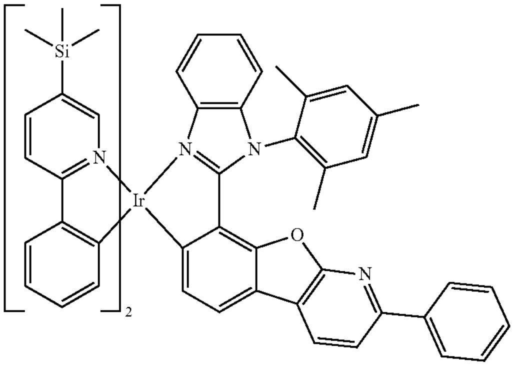
210
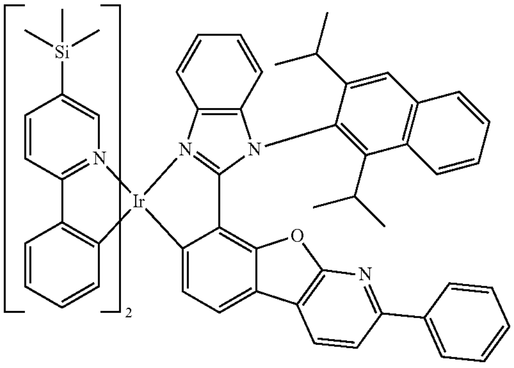

-continued
211
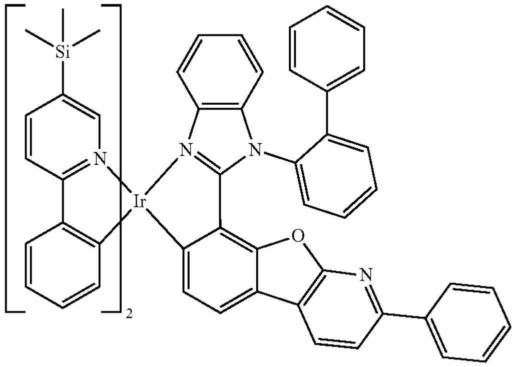
212
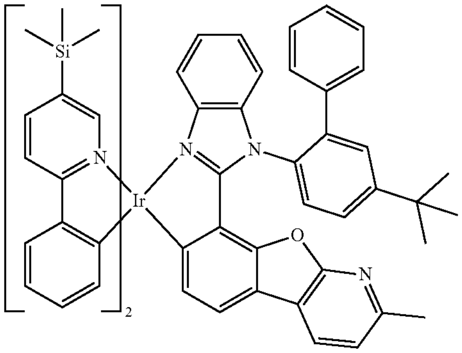
213
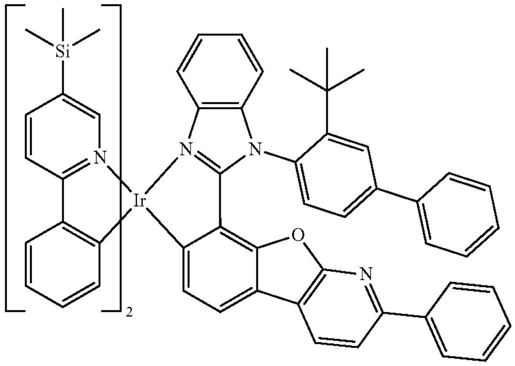
214
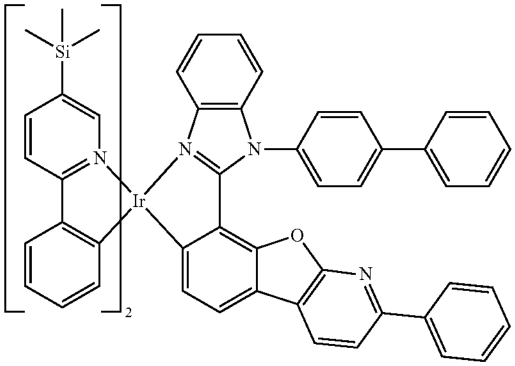
-continued
215
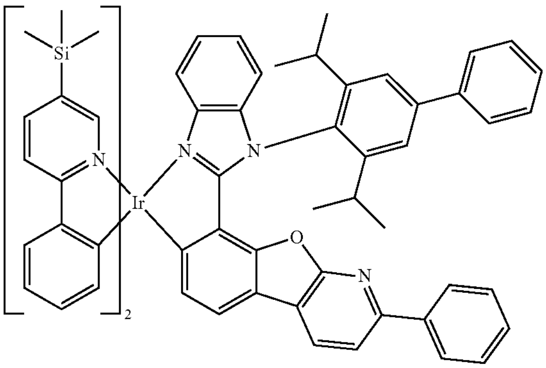
216
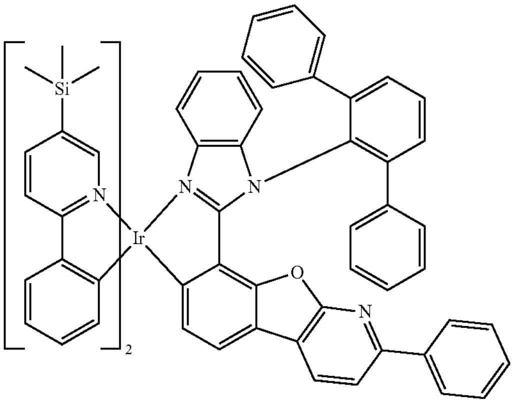
217
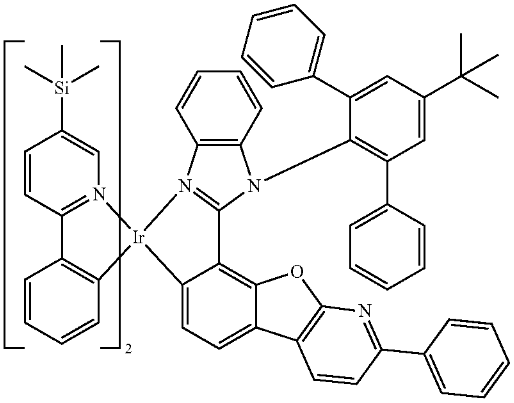
218
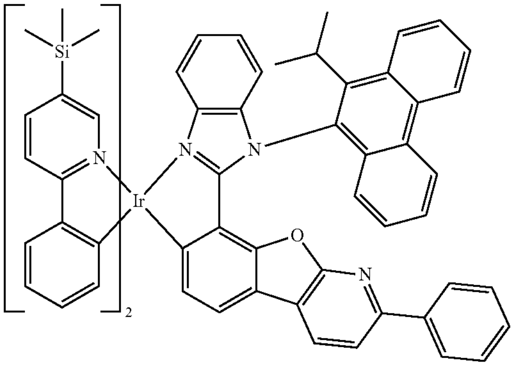

-continued
219
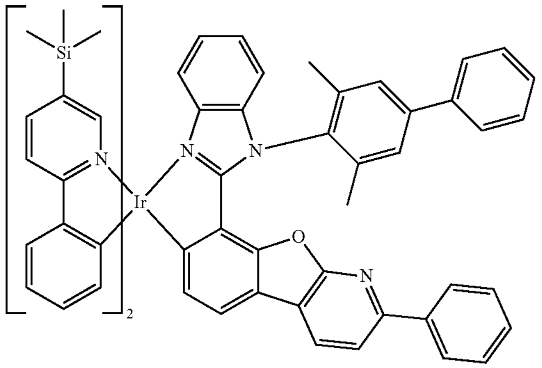
220
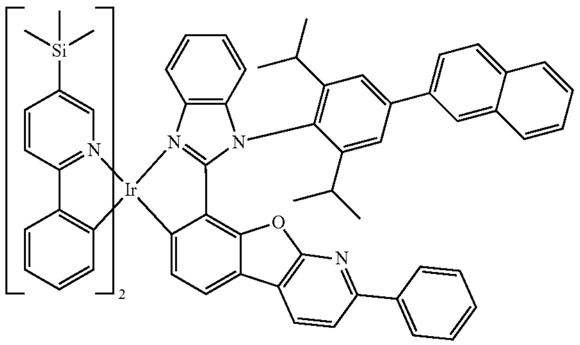
221
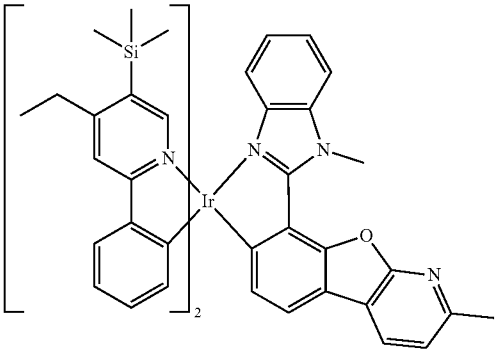
222
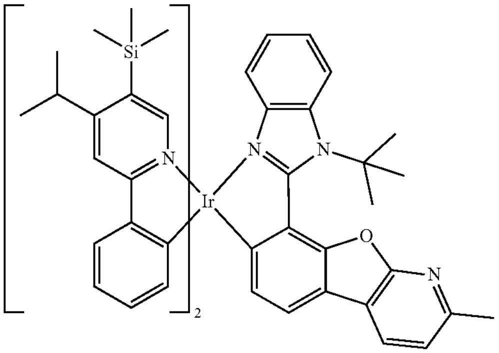
-continued
223
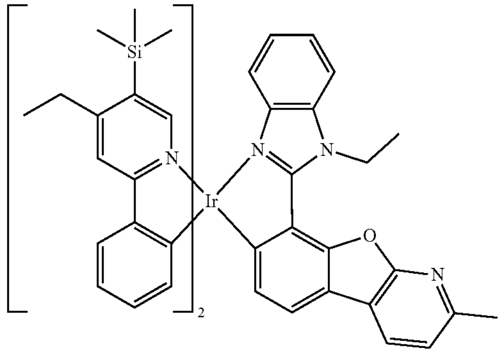
224
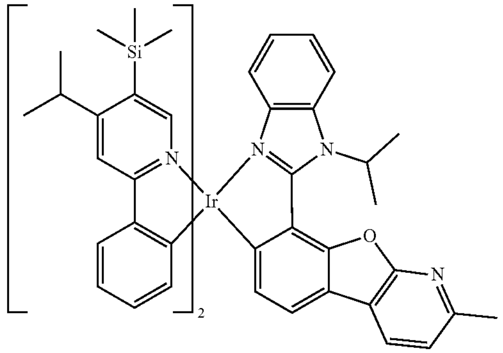
225
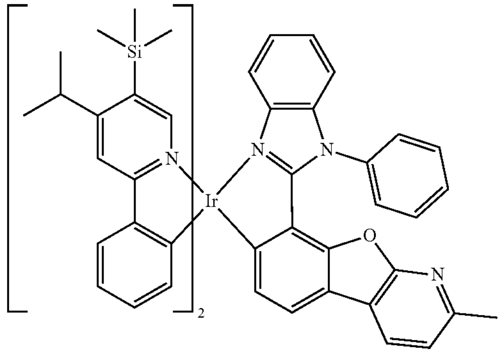
226
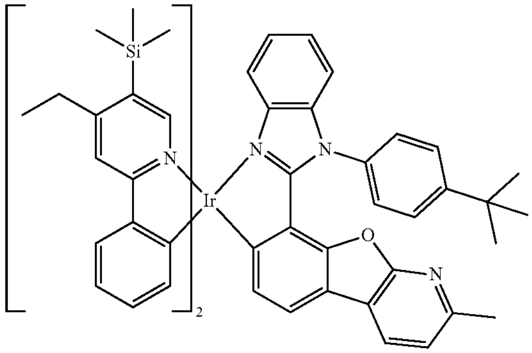

-continued
227
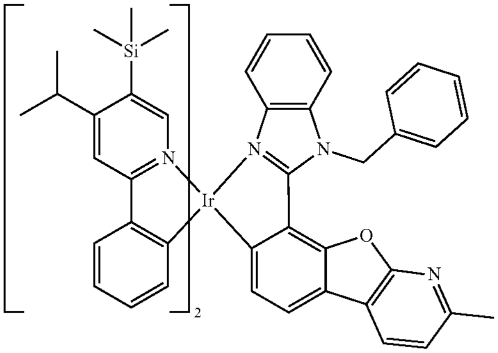
228
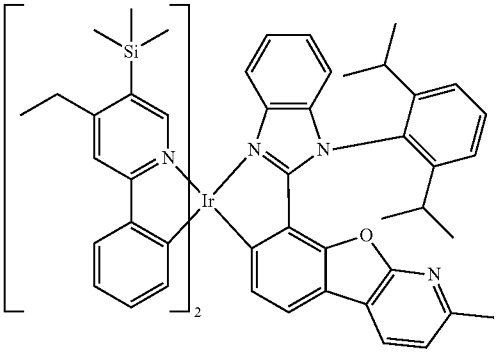
229
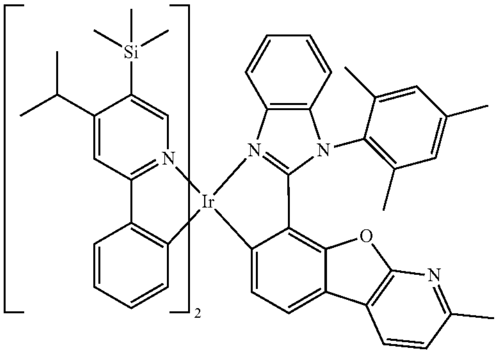
230
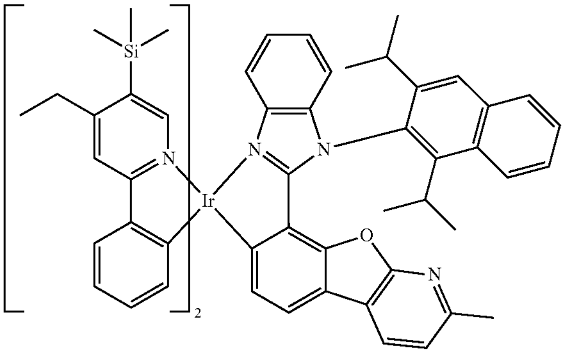
-continued
231
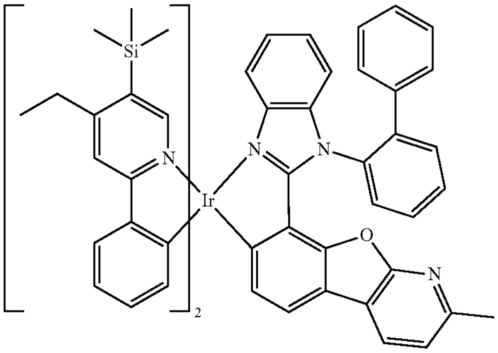
232
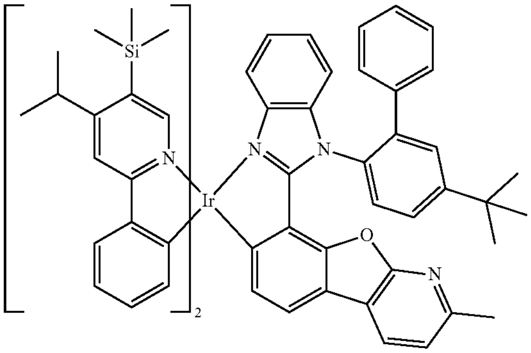
233
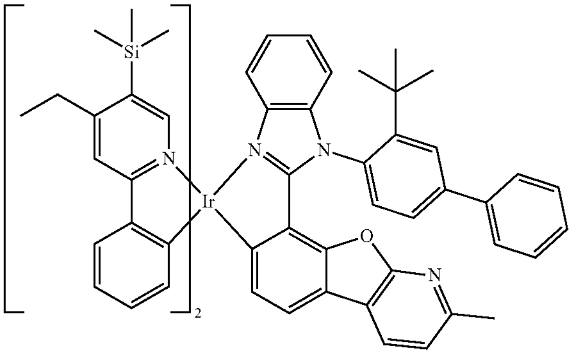
234
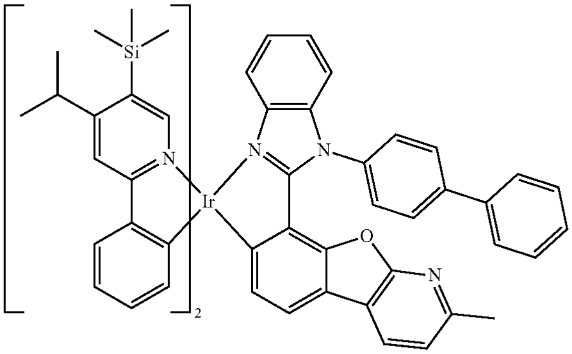

-continued
235
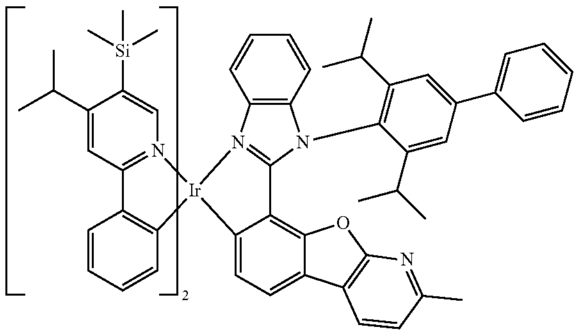
236
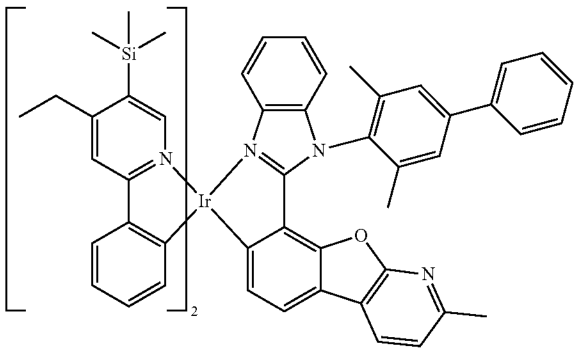
237
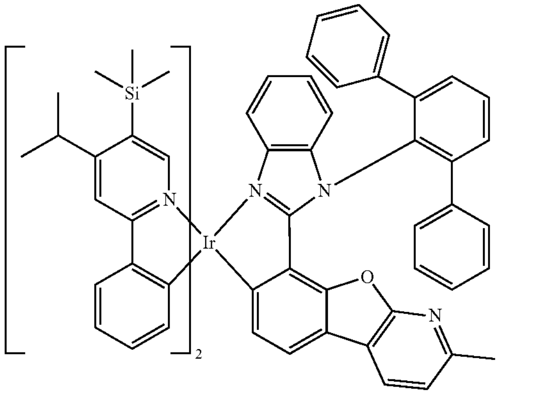
238
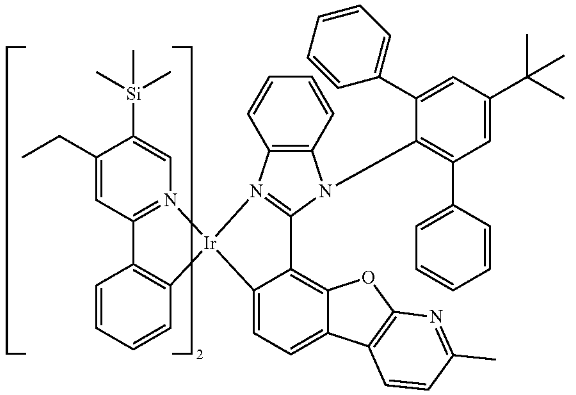
-continued
239
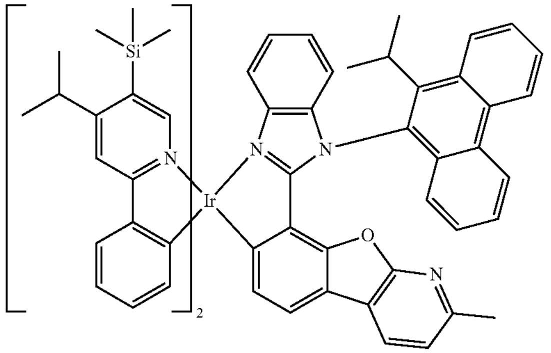
240
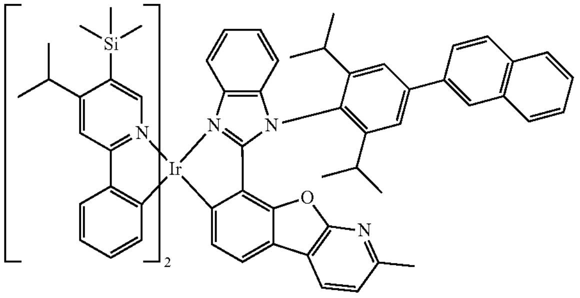
241
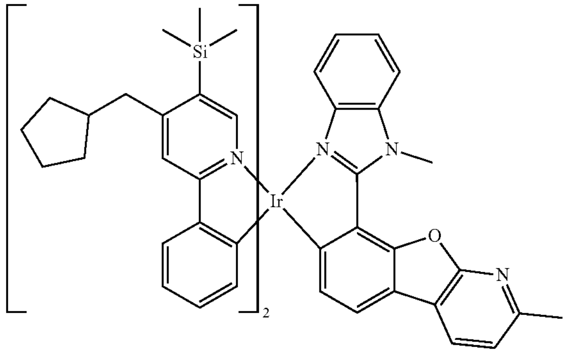
242
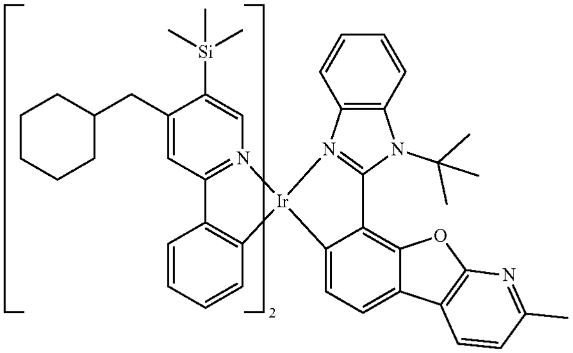

243
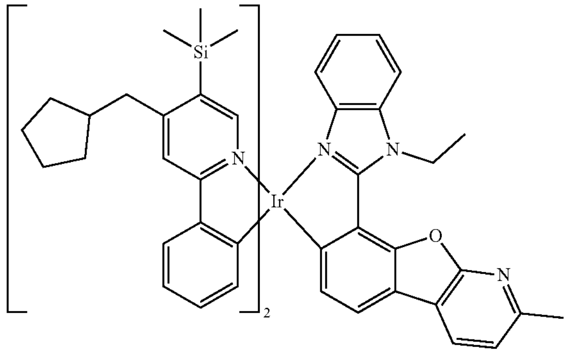
244
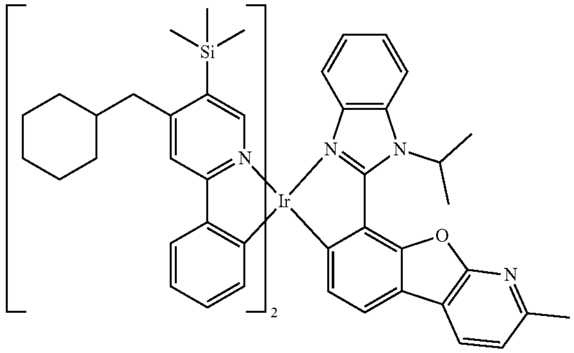
245
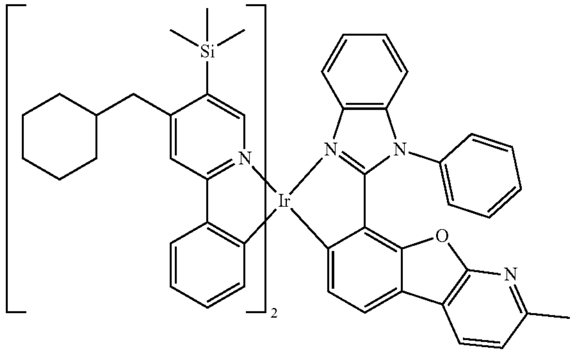
246
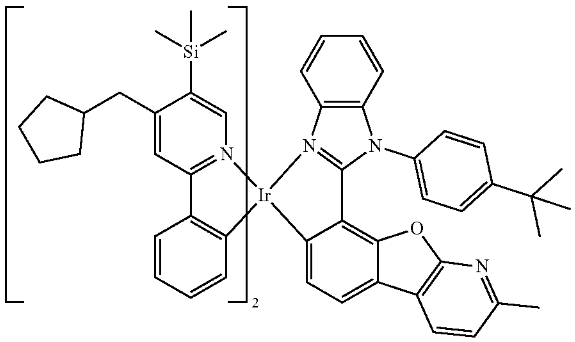
247
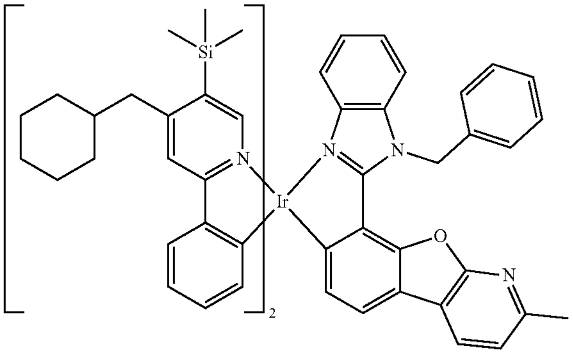
248
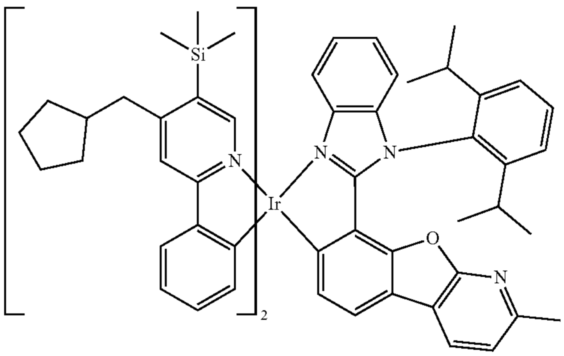
249
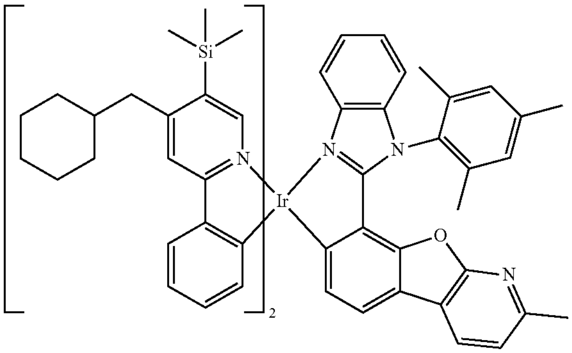
250
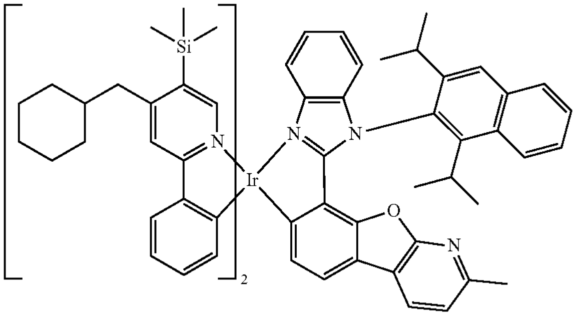

-continued
251
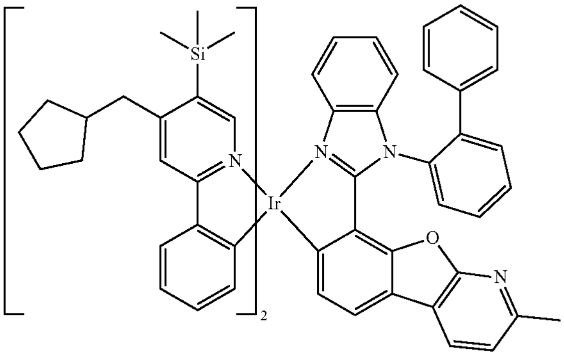
252
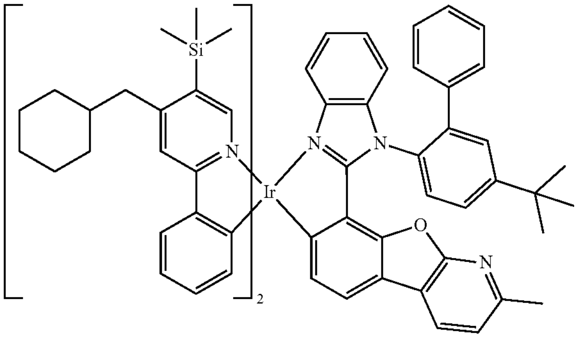
253
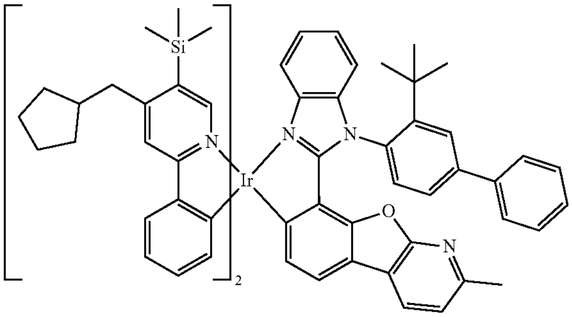
254
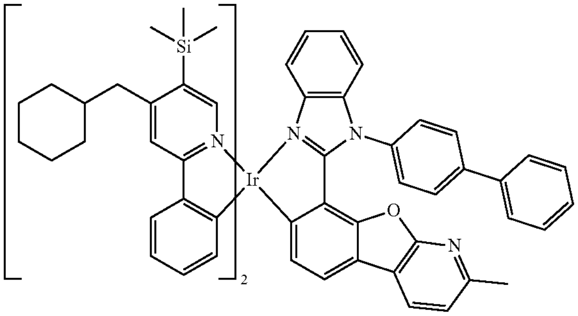
-continued
255
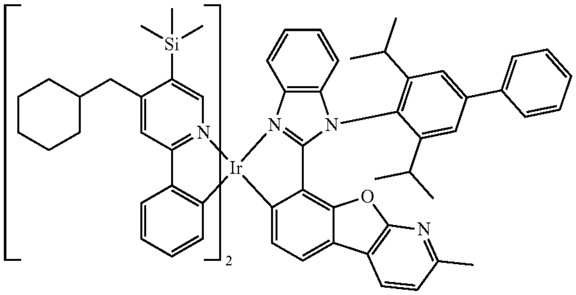
256
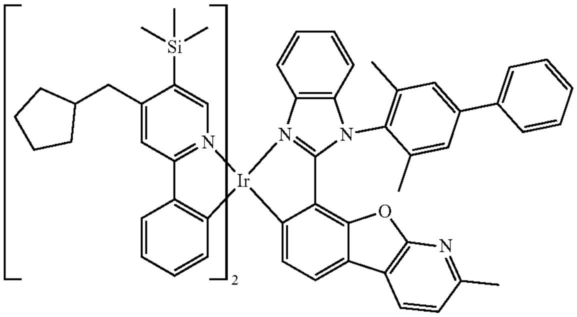
257
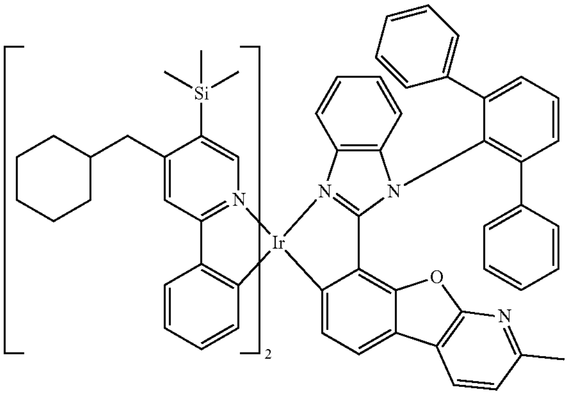
258
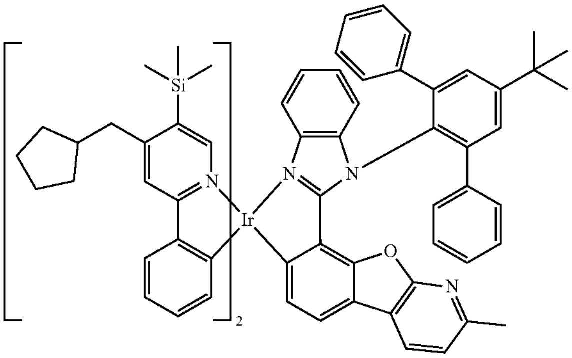

-continued
259
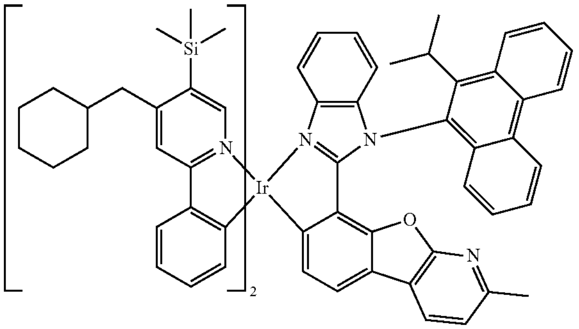
260
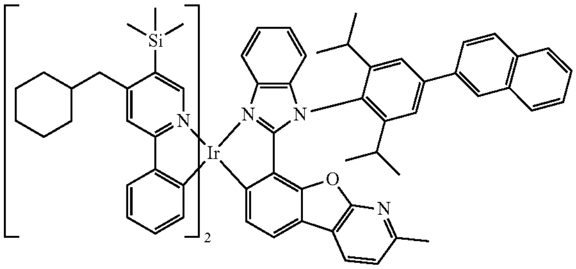
261
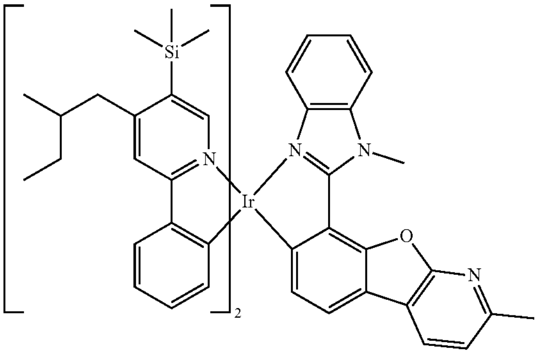
262
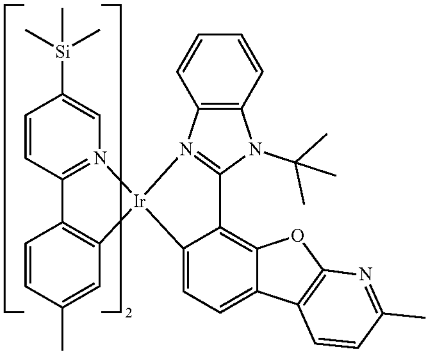
-continued
263
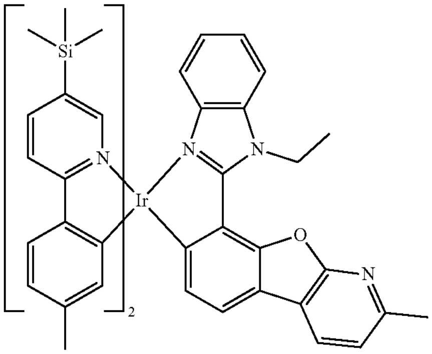
264
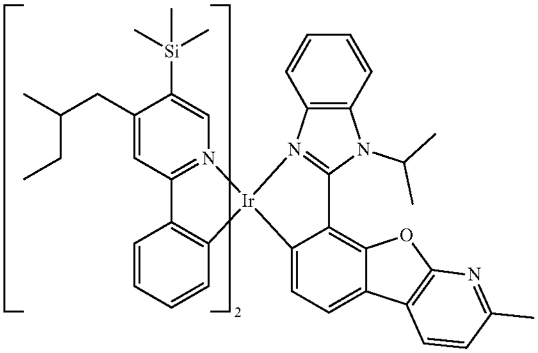
265
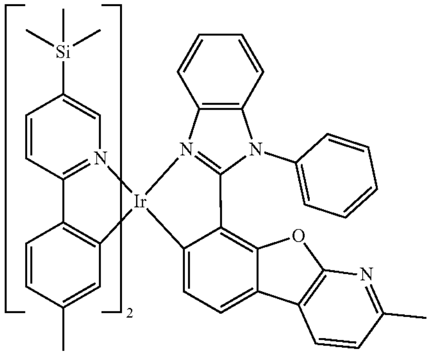
266
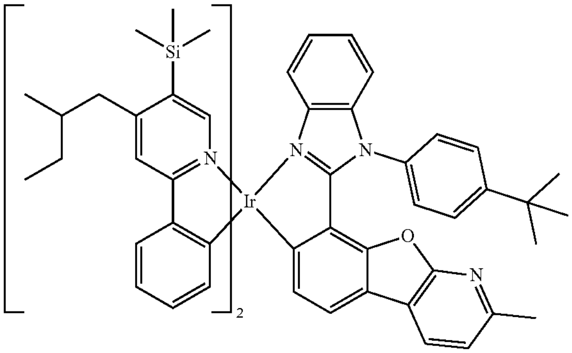

267
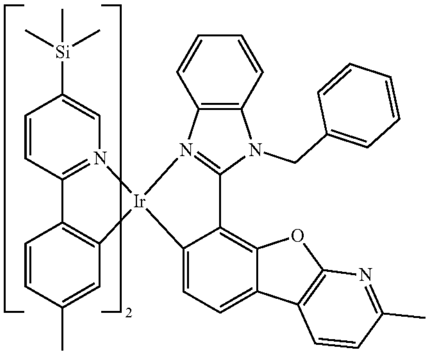
268
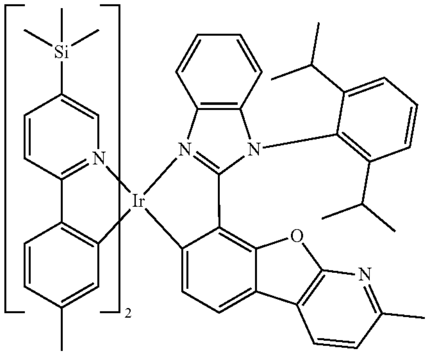
269
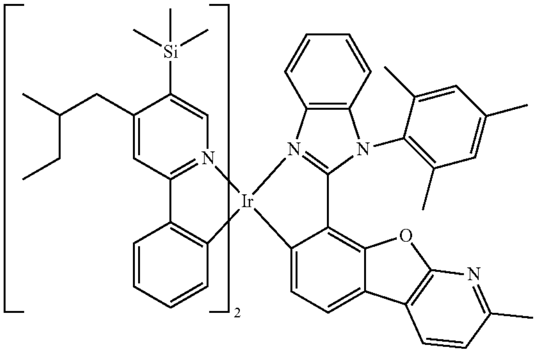
270
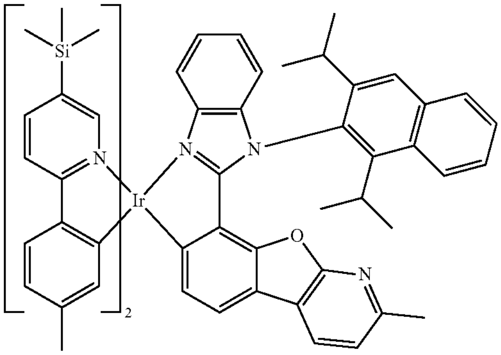
271
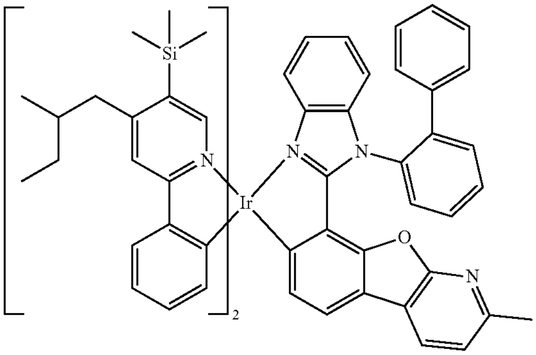
272
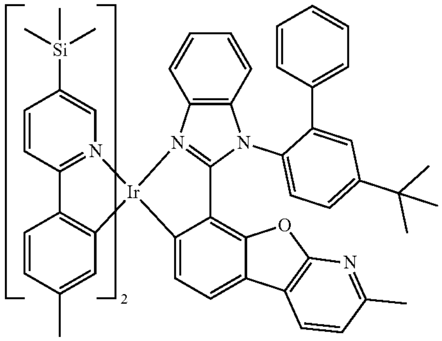
273
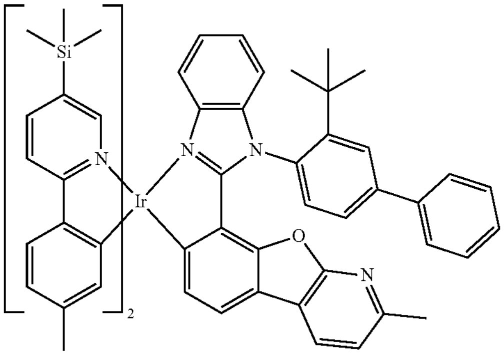
274
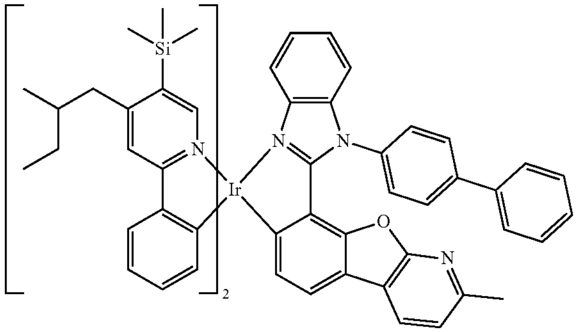

-continued
275
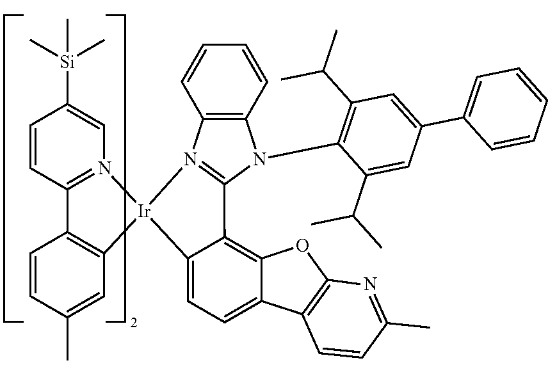
276
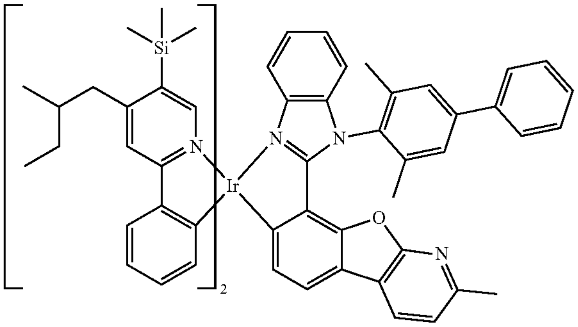
277
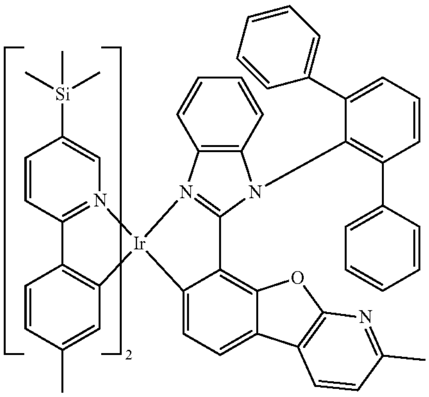
278
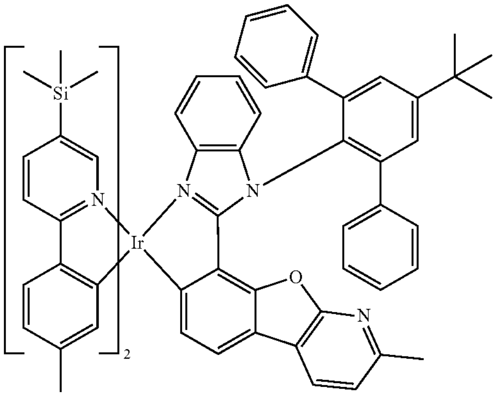
-continued
279
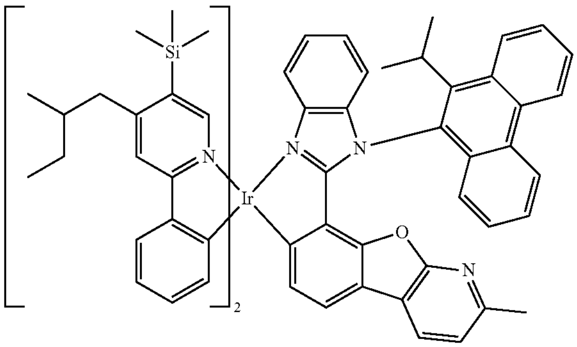
280
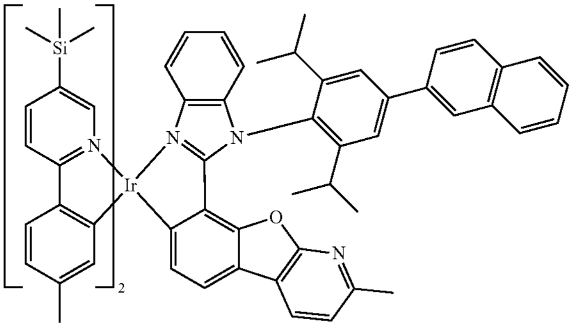
281
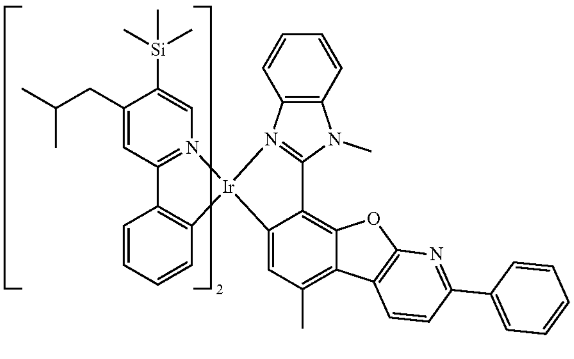
282
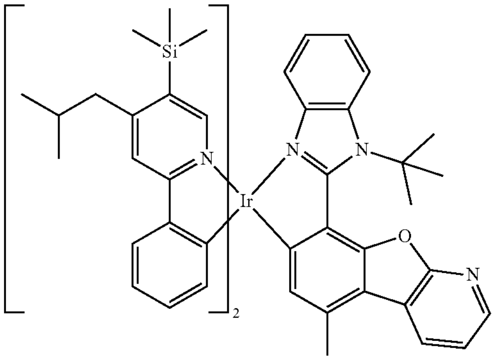

-continued
283
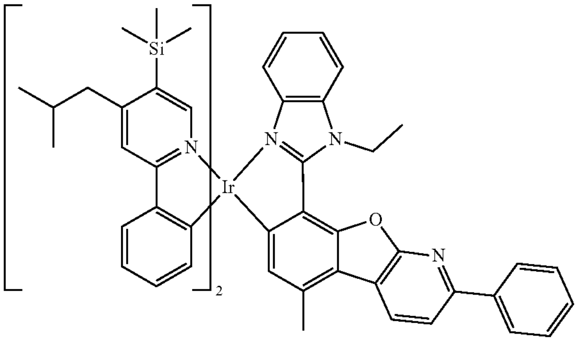
284
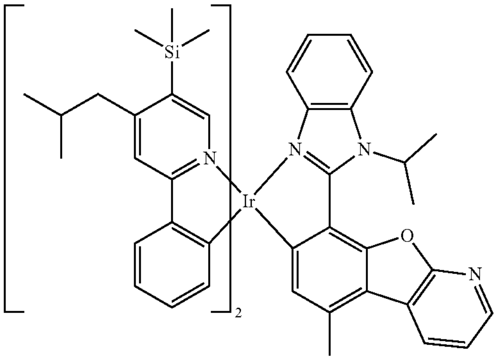
285
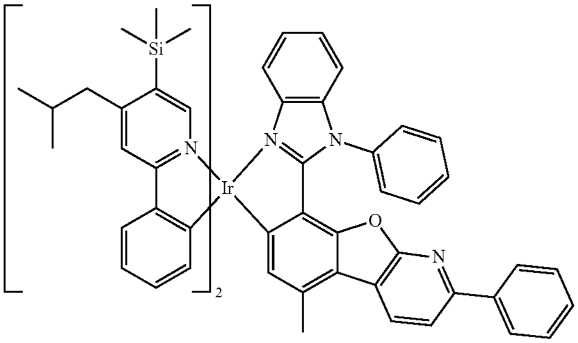
286
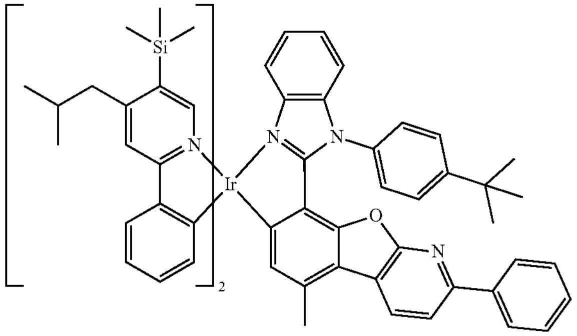
-continued
287
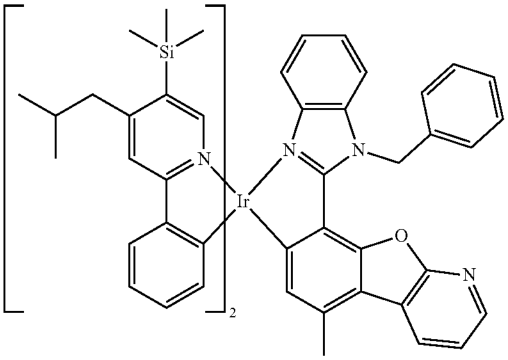
288
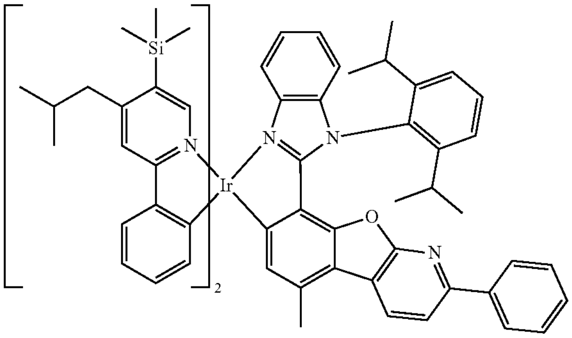
289
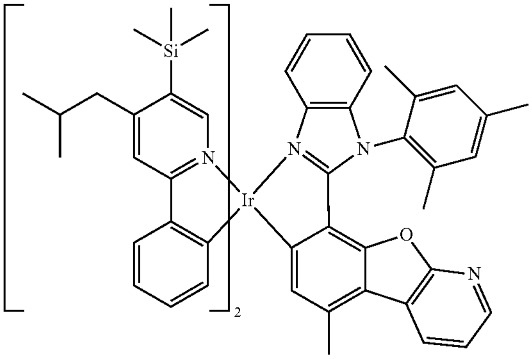
290
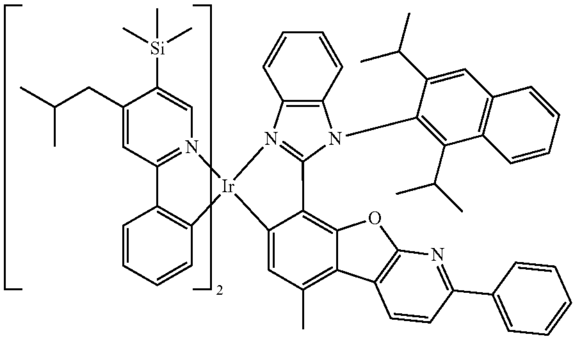

291
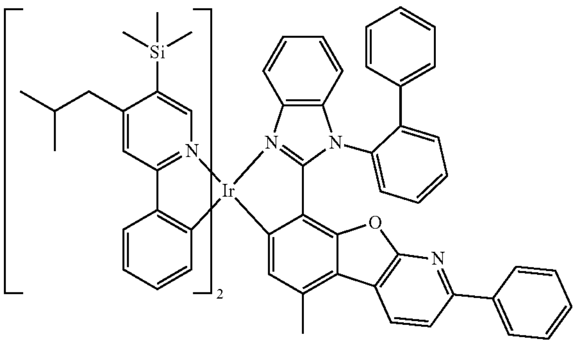
292
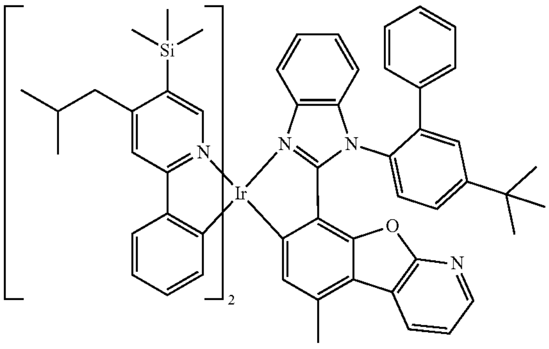
293
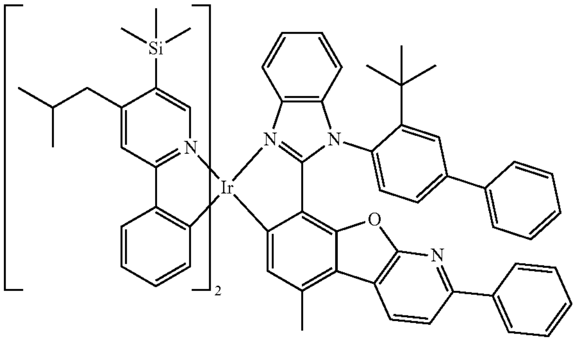
294
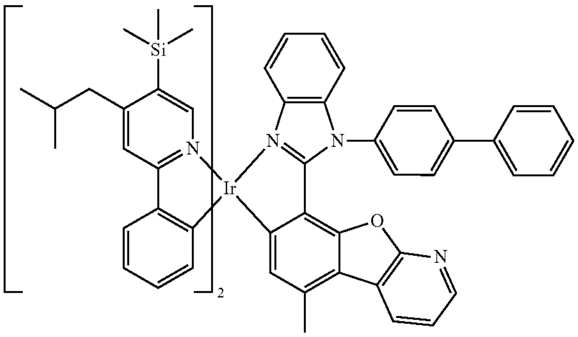
295
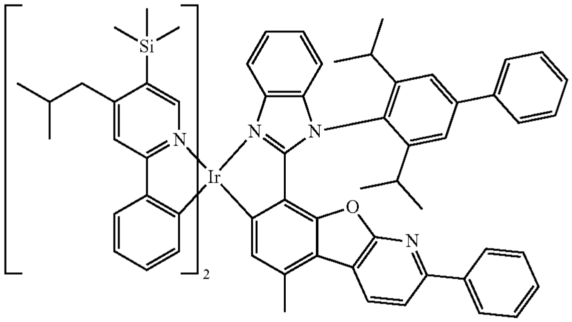
296
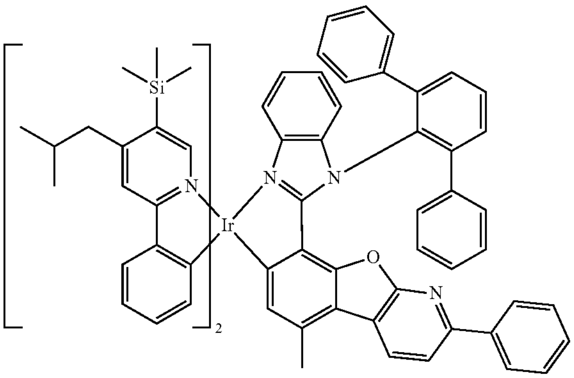
297
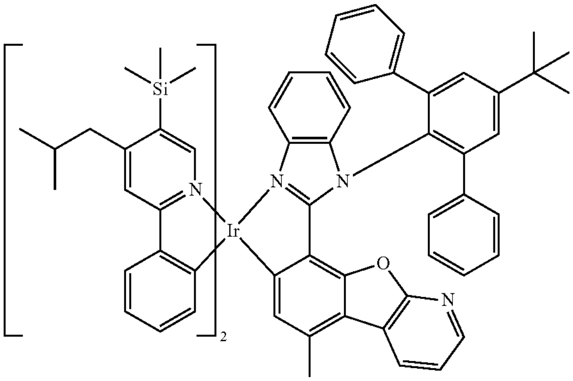
298
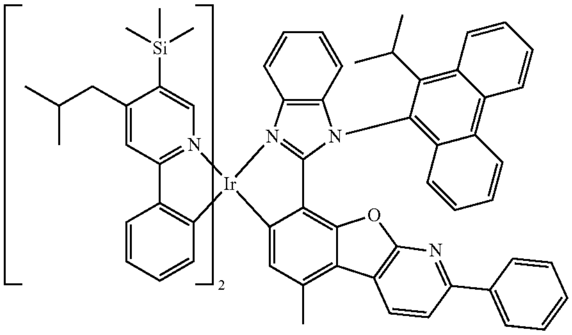

-continued
299
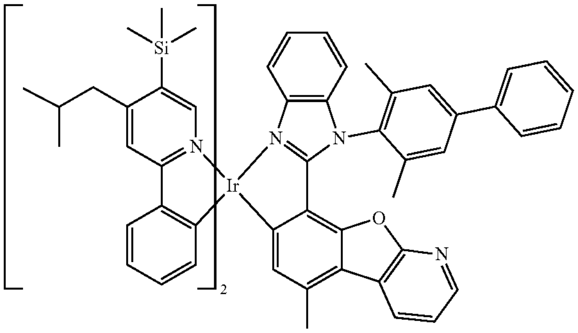
300
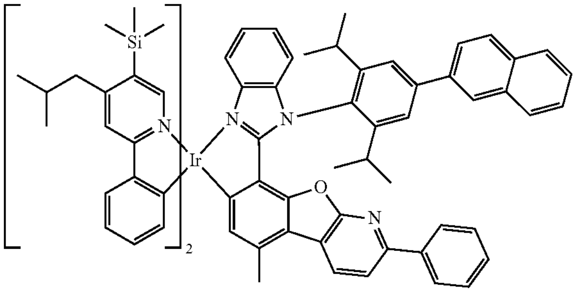
301
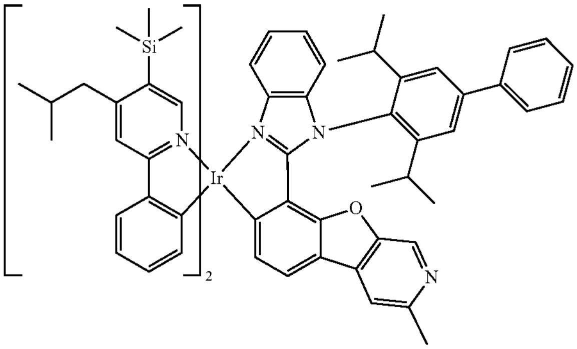
302
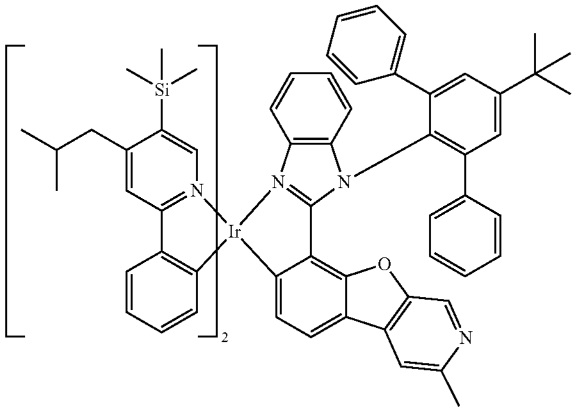
-continued
303
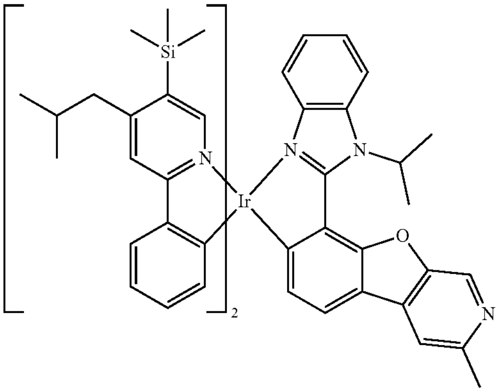
304
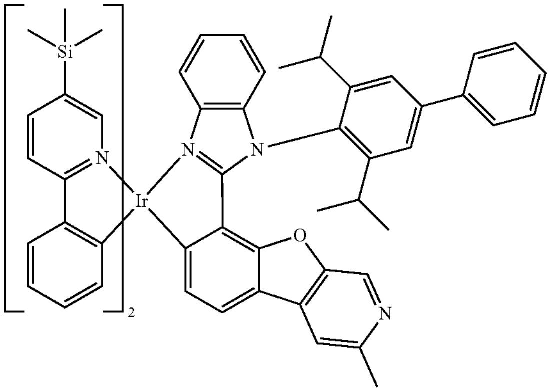
305
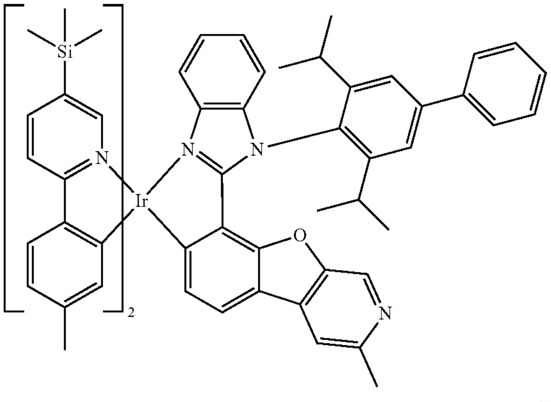
306
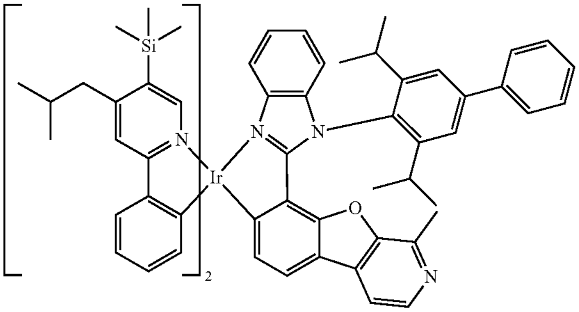

-continued
307
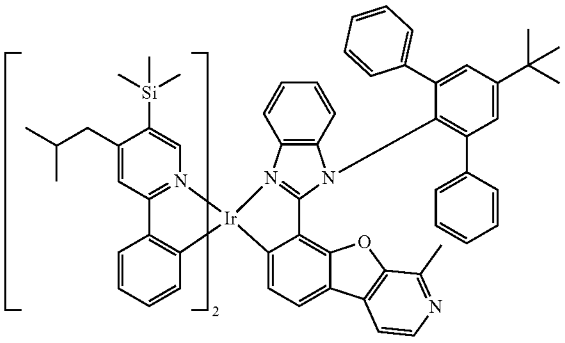
308
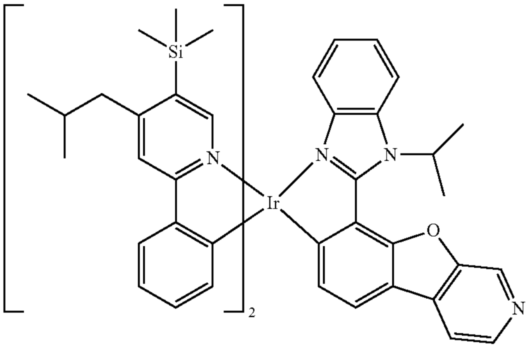
309
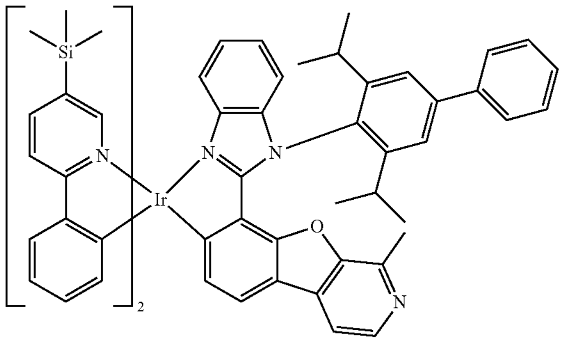
310
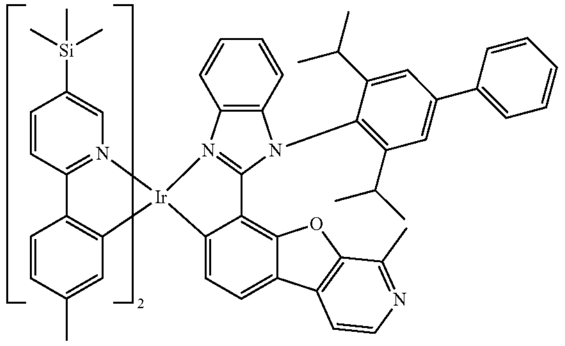
311
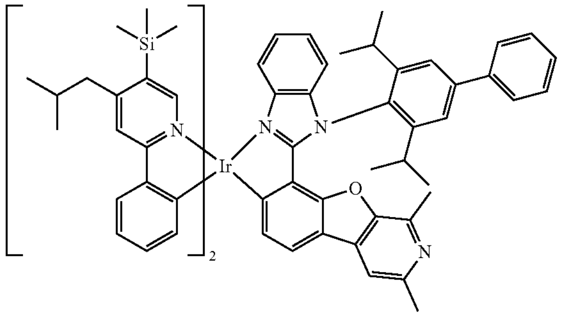
312
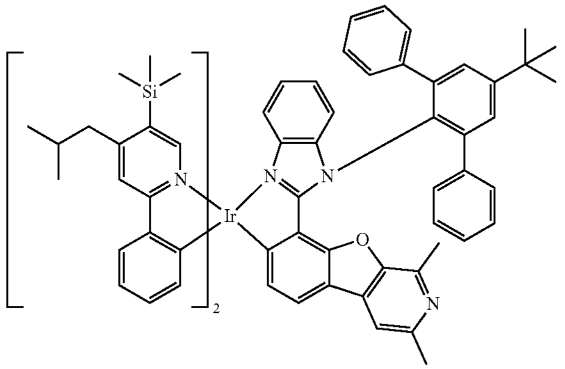
313
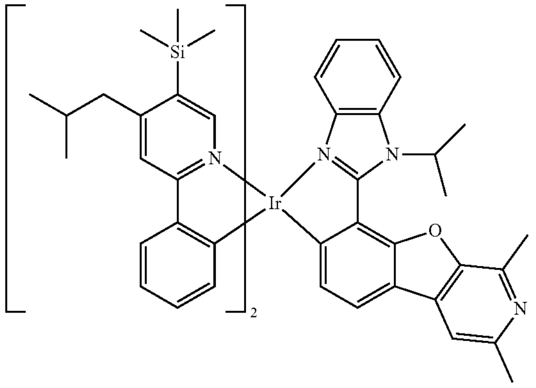
314
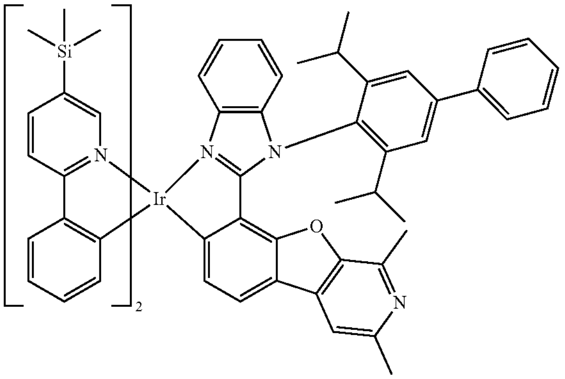

315
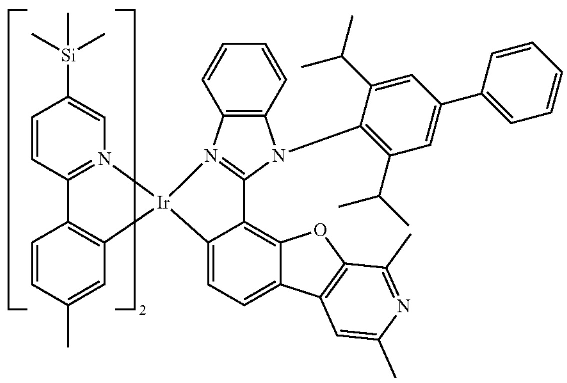
316
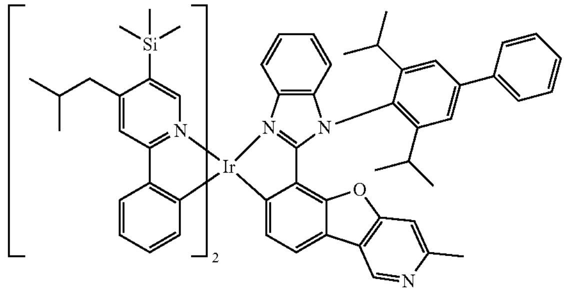
317
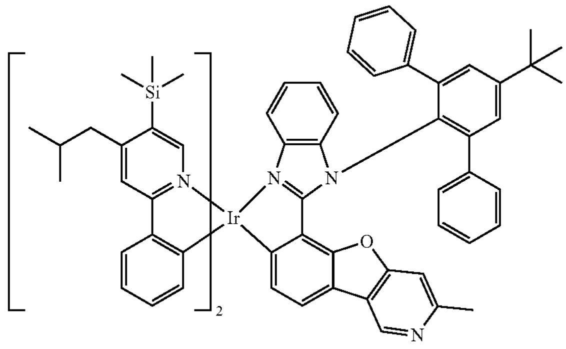
318
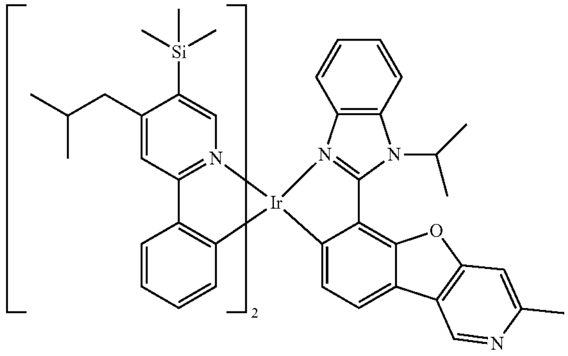
319
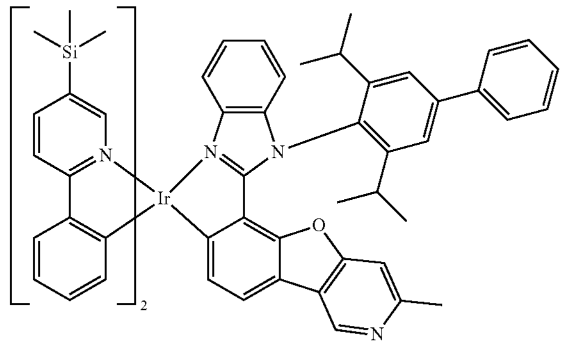
320
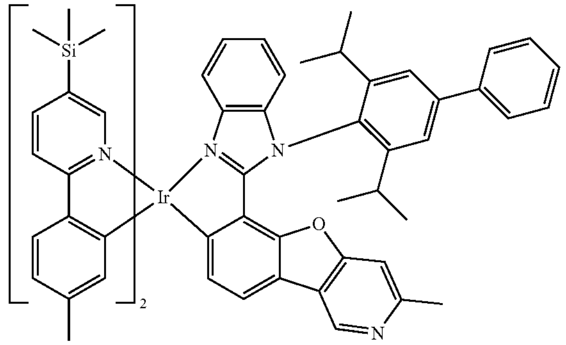
321
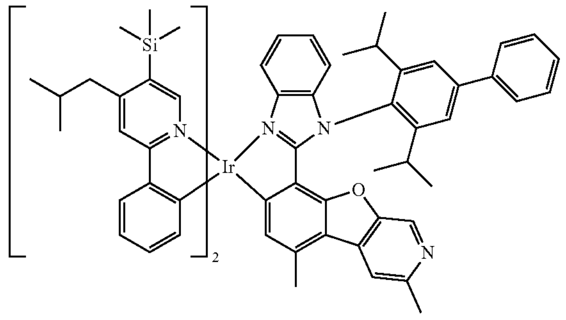
322
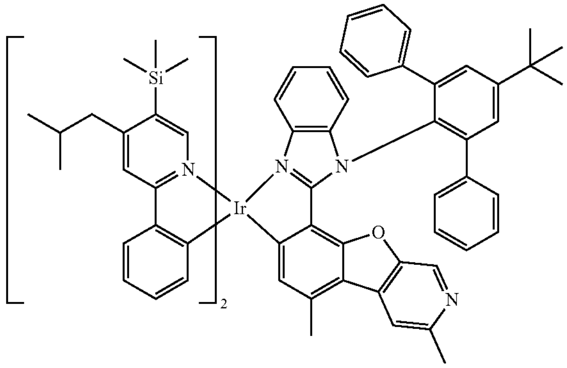

323
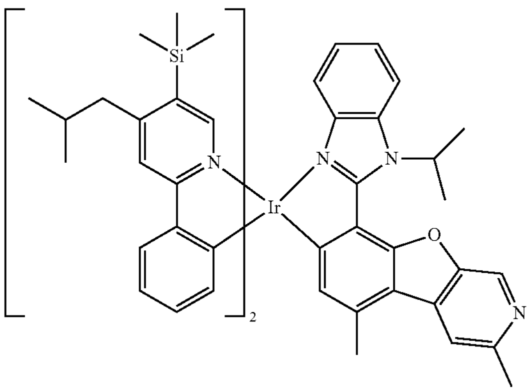
324
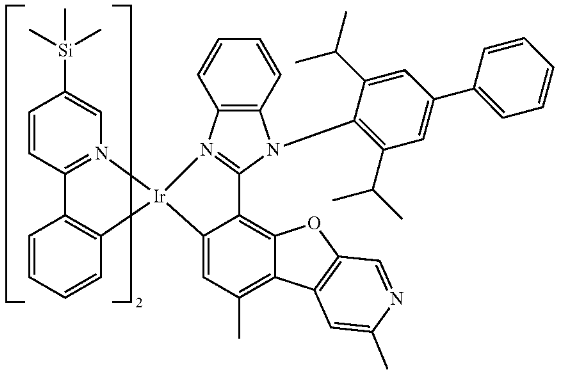
325
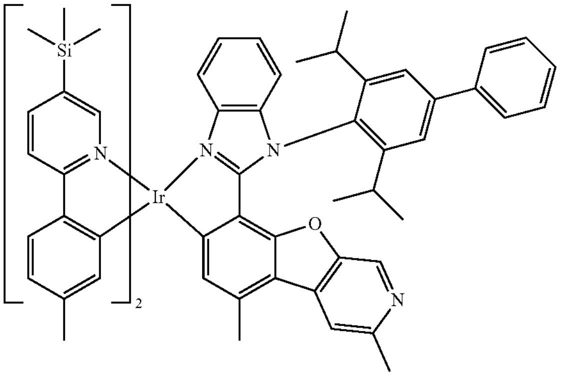
326
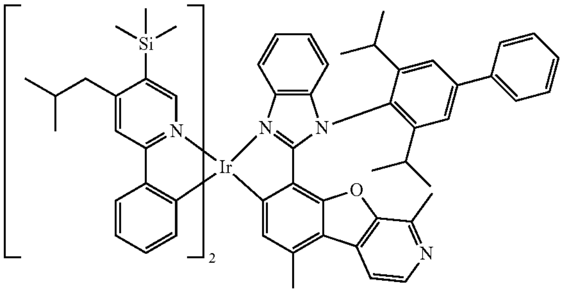
327
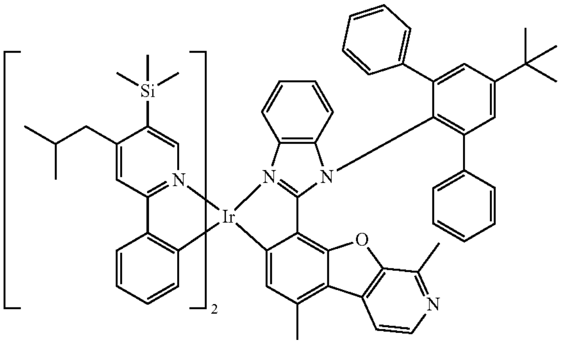
328
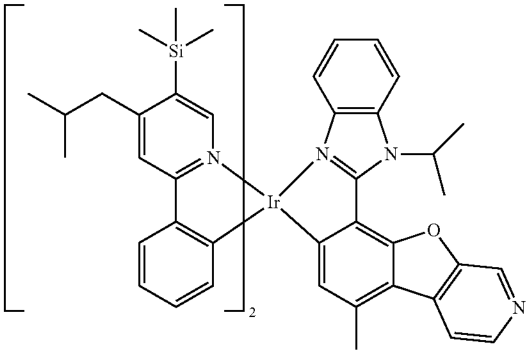
329
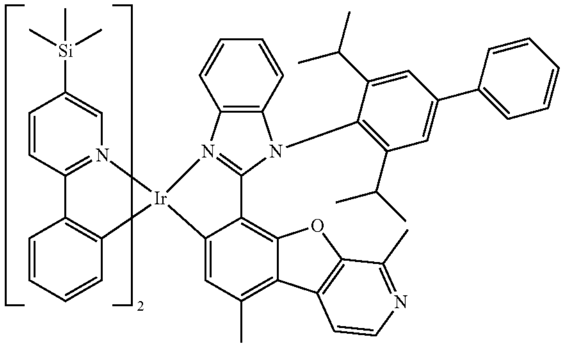
330
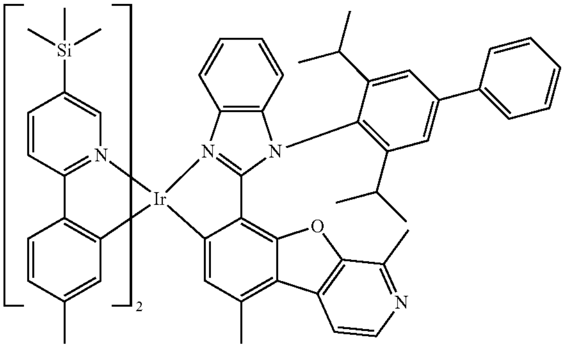

331
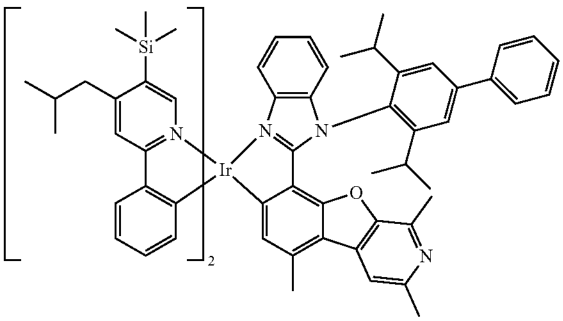
332
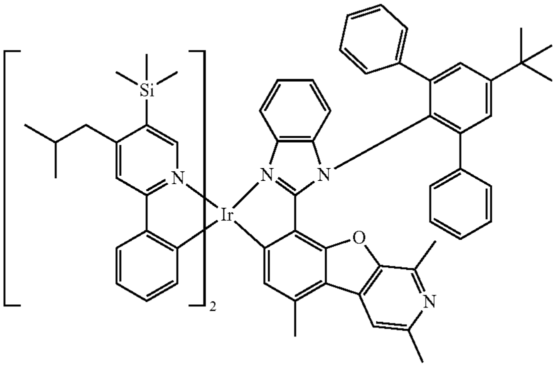
333
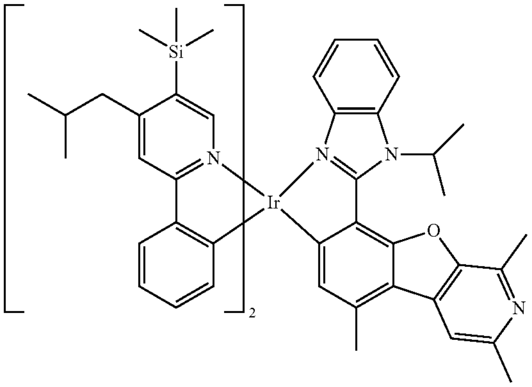
334
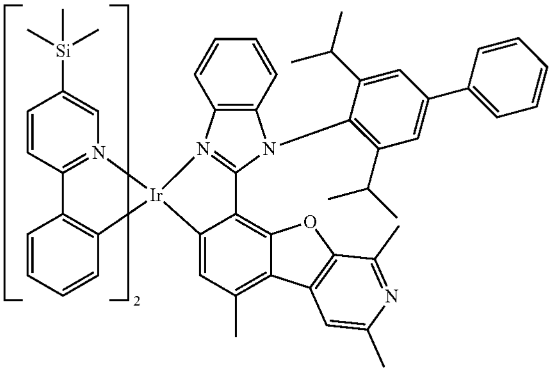
335
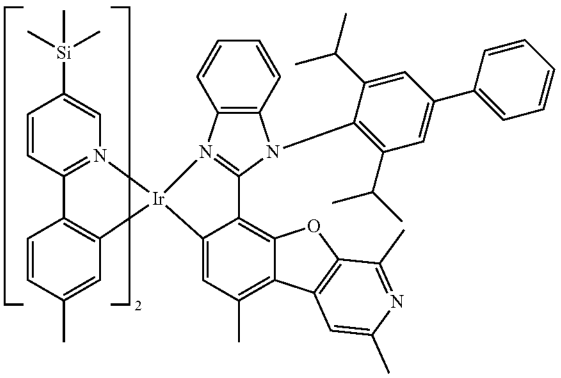
336
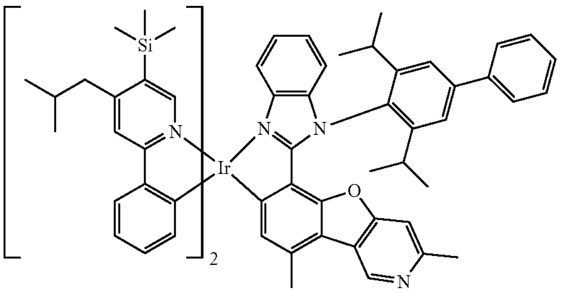
337
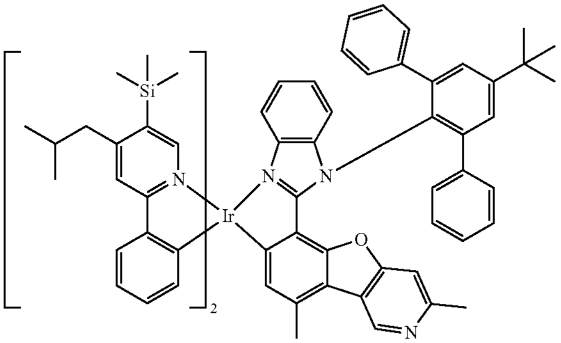
338
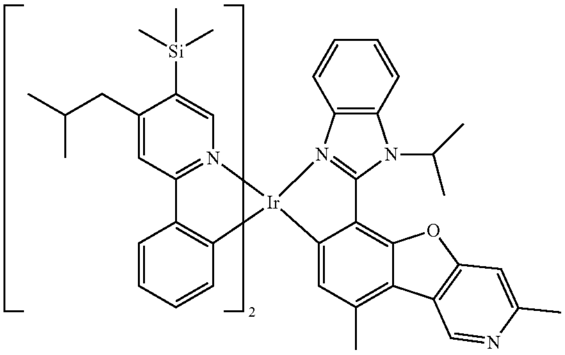

-continued
339
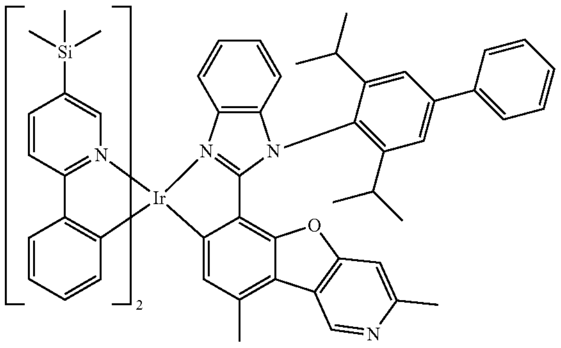
340
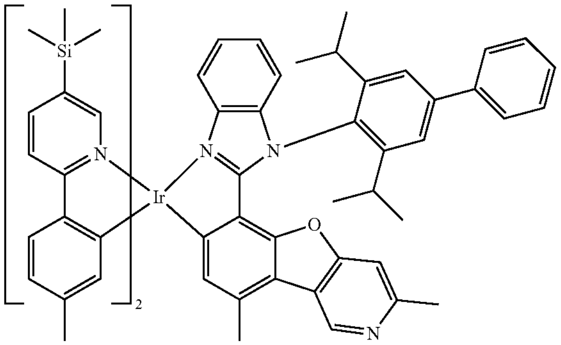
341
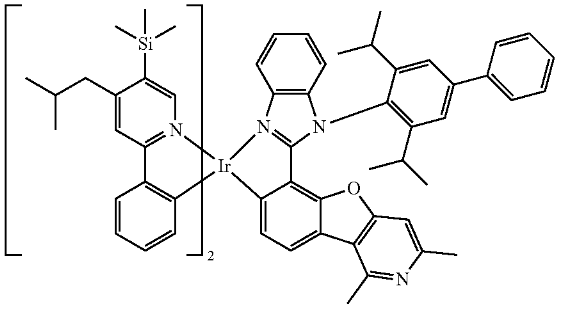
342
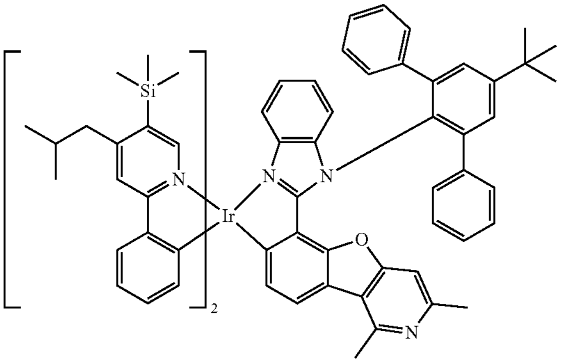
-continued
343
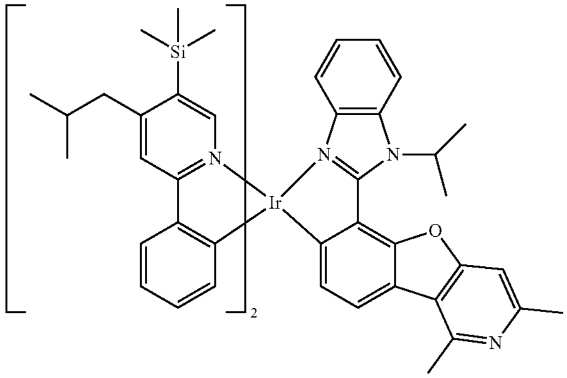
344
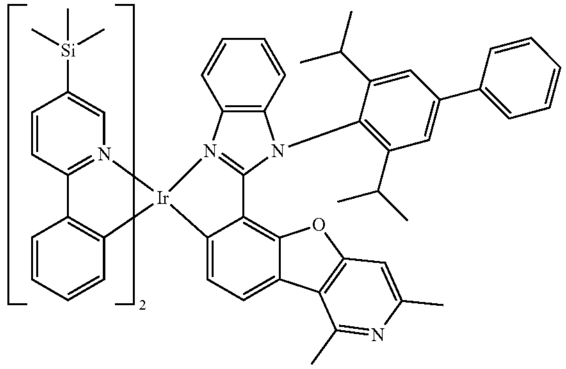
345
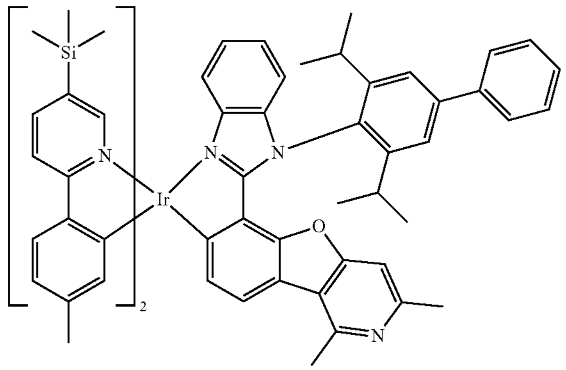
346
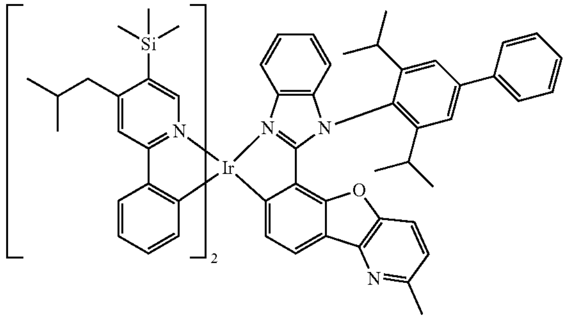

347
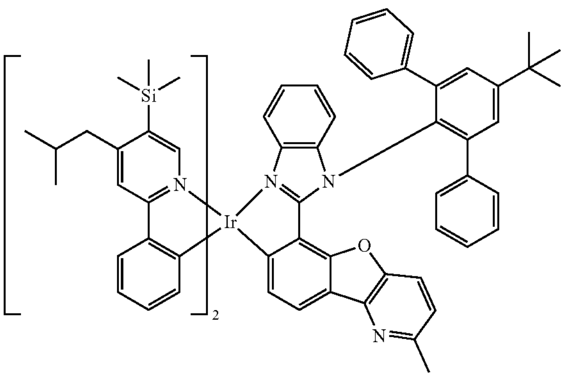
348
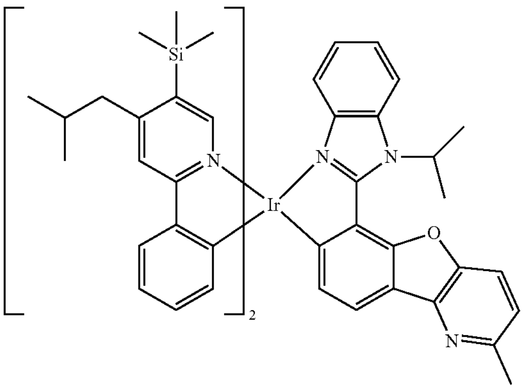
349
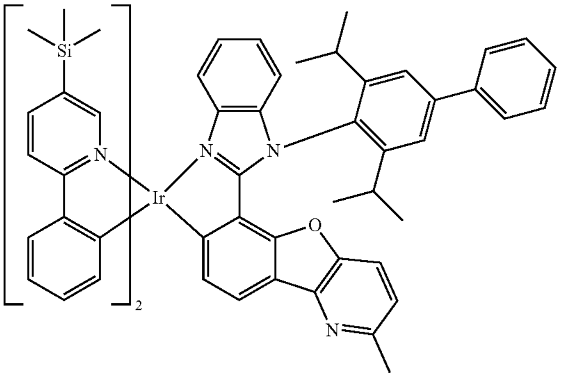
350
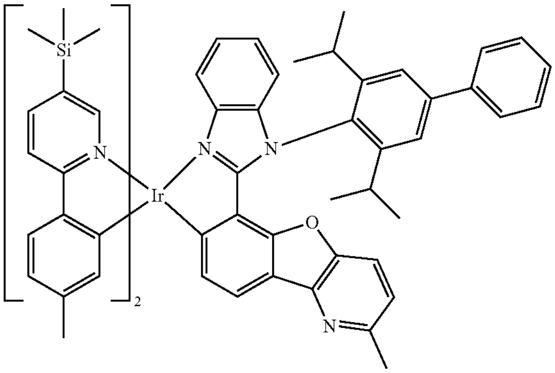
351
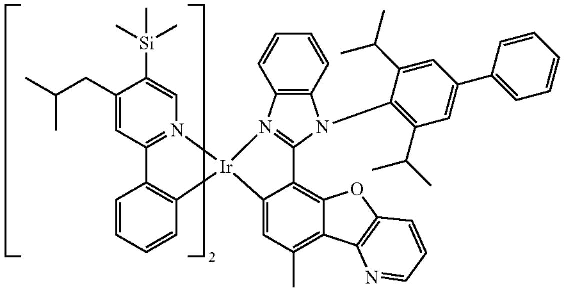
352
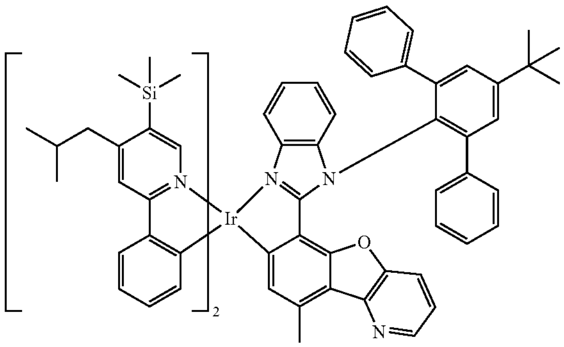
353
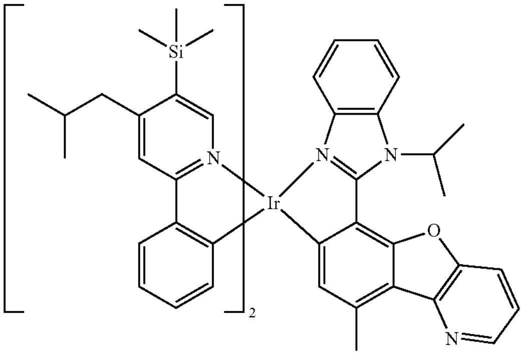
354
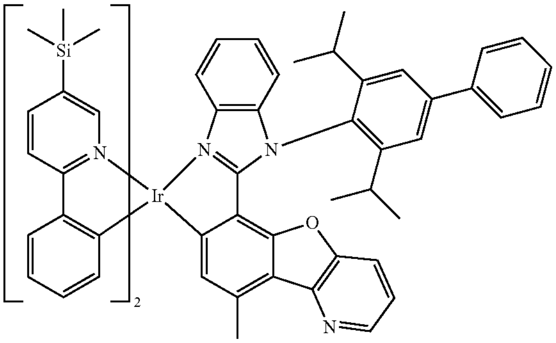

-continued
355
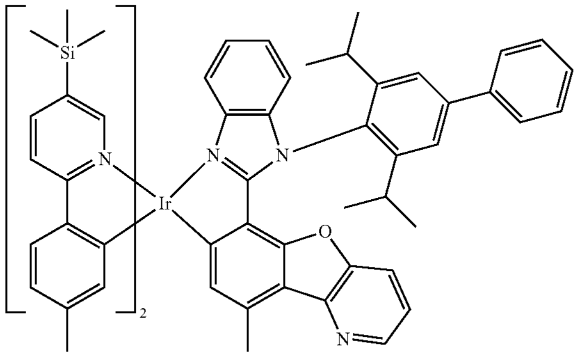
356
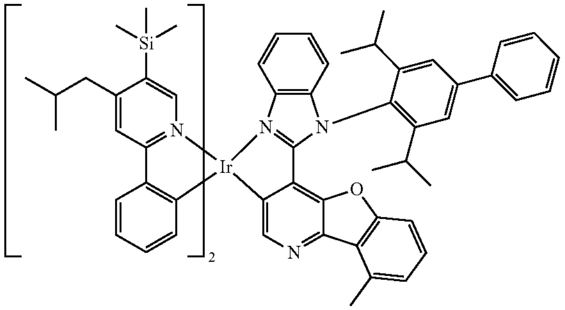
357
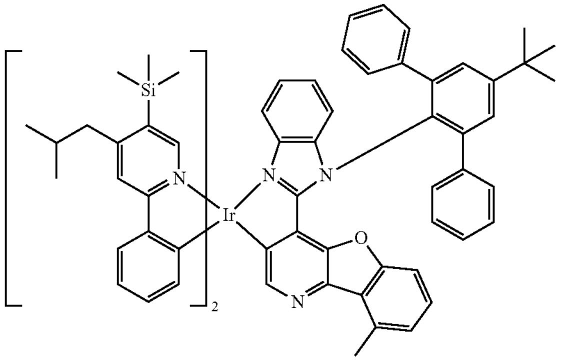
358
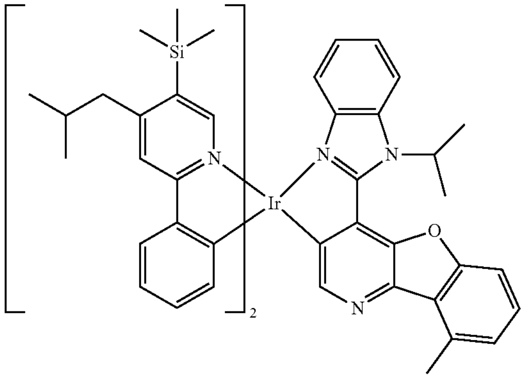
-continued
359
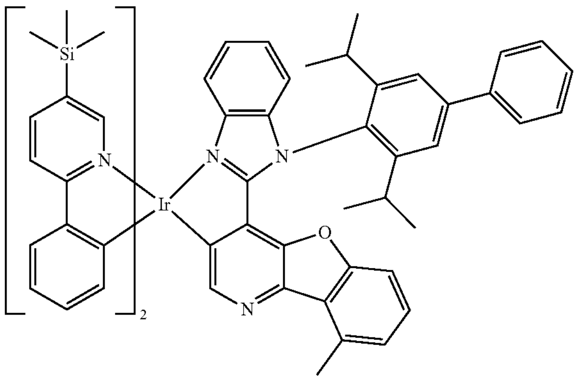
360
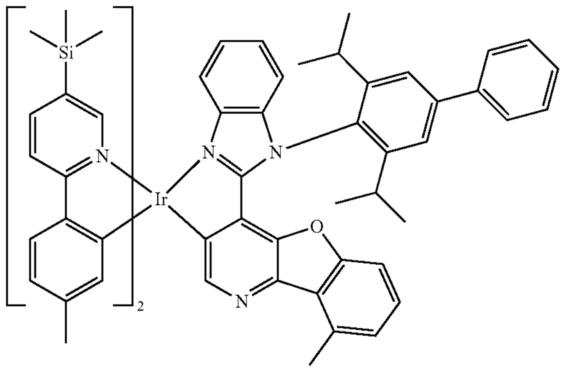
361
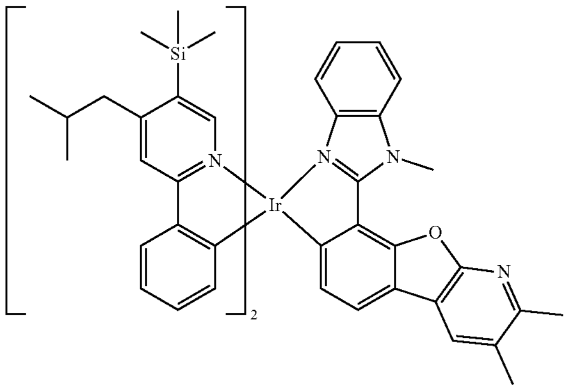
362
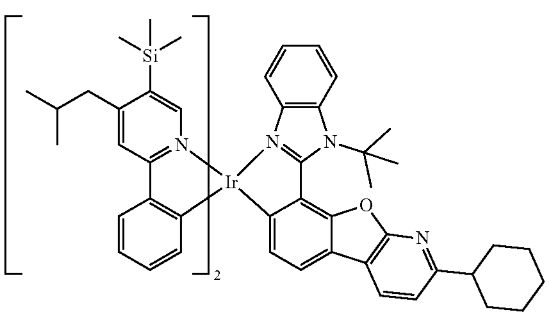

-continued
363
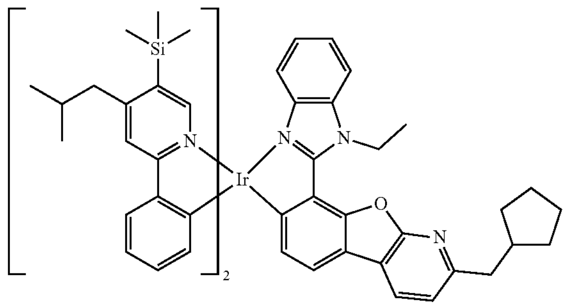
364
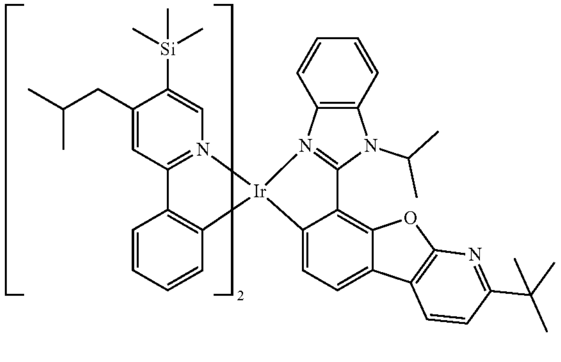
365
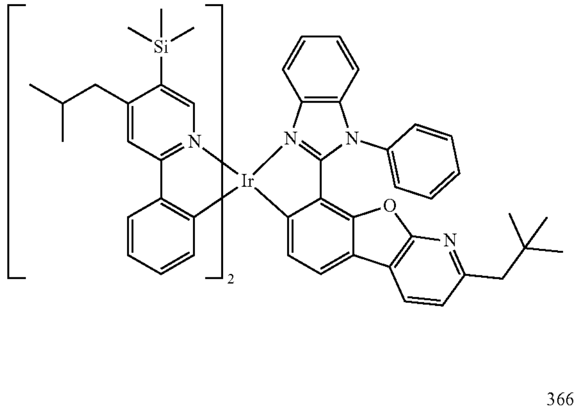
366
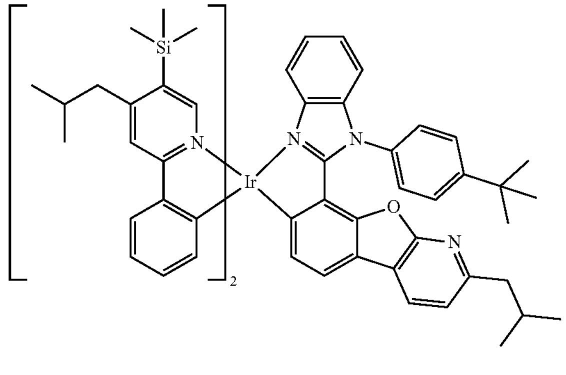
-continued
367
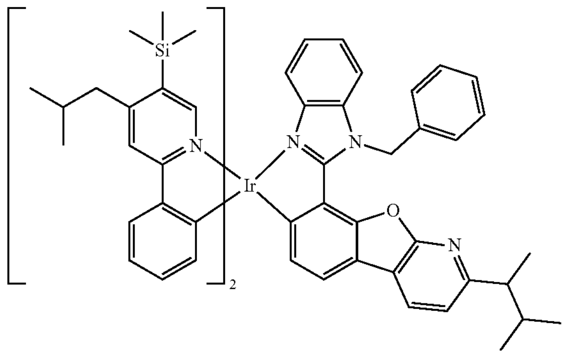
368
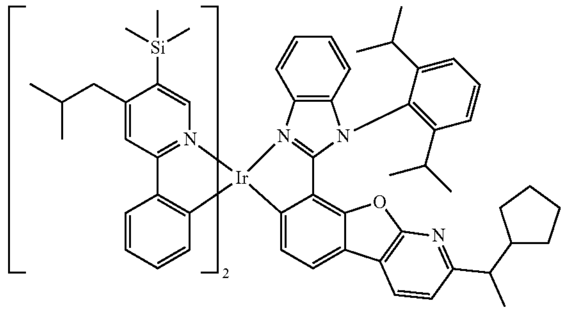
369
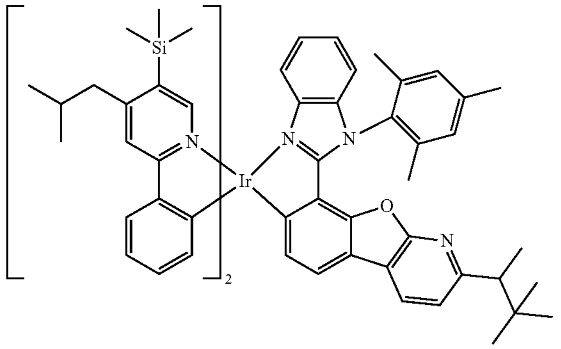
370
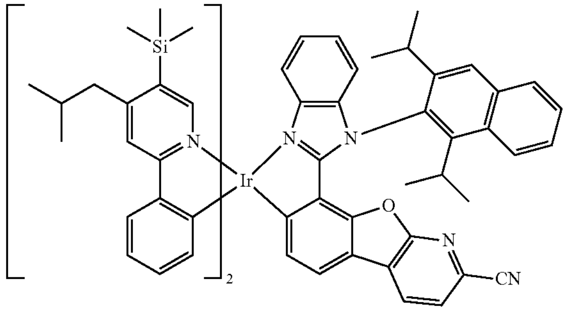

-continued
371
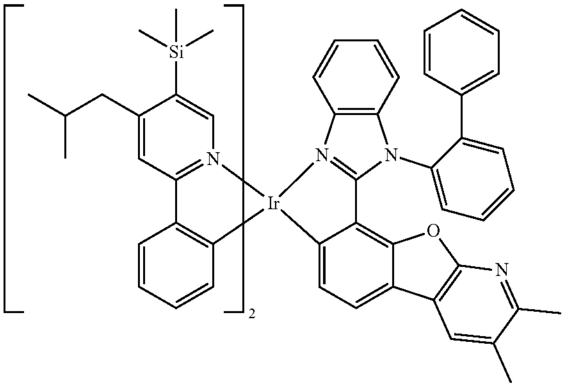
372
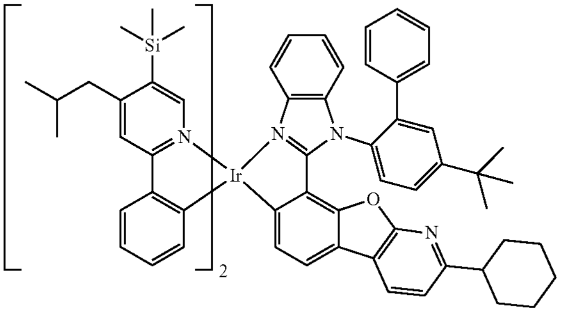
373
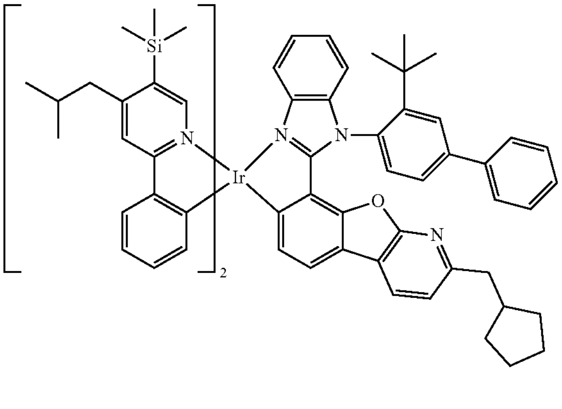
374
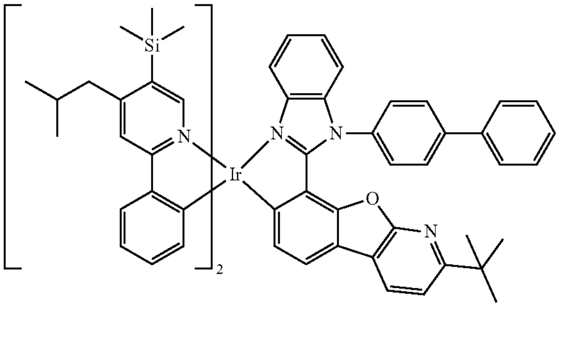
-continued
375
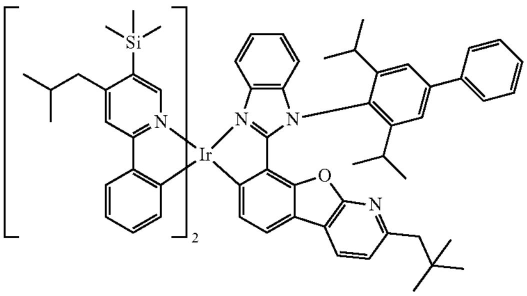
376
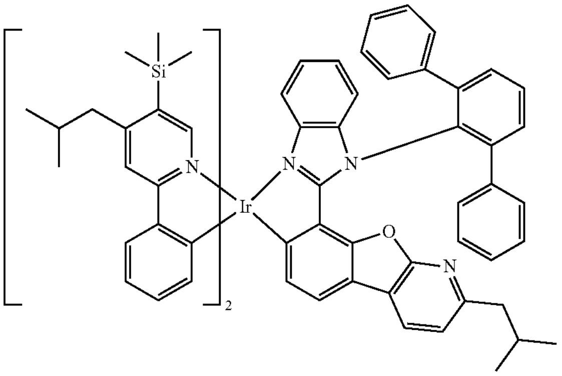
377
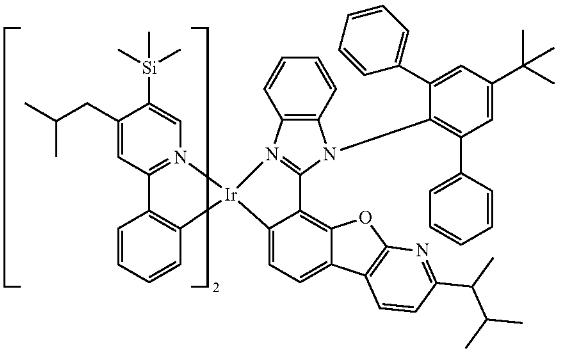
378
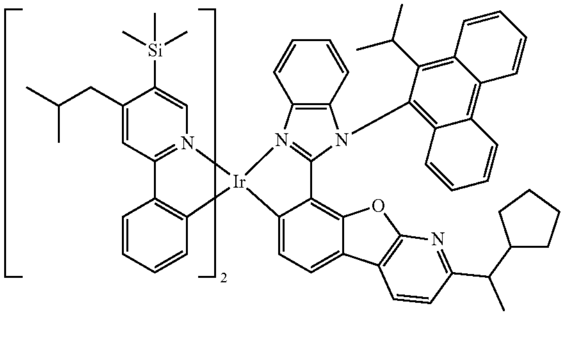

-continued
379
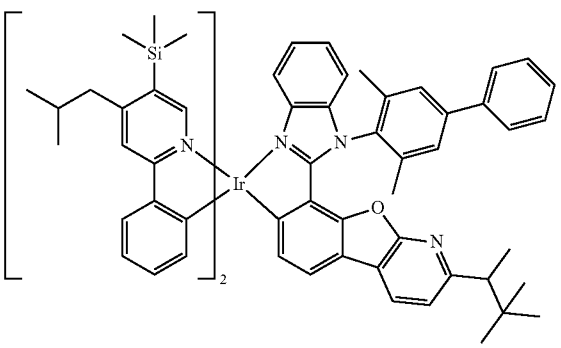
380
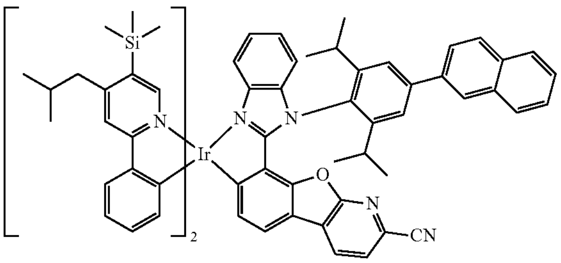
381
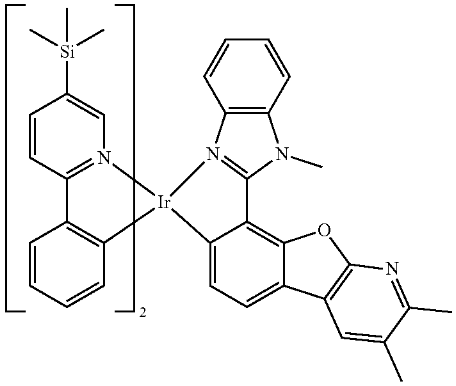
382
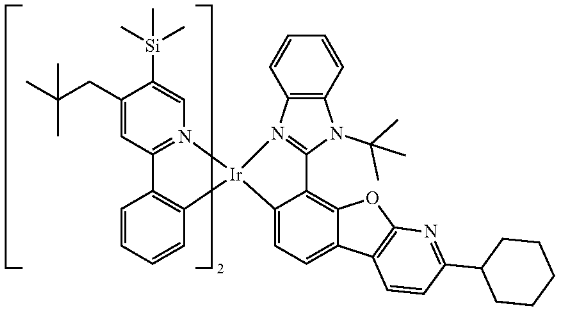
-continued
383
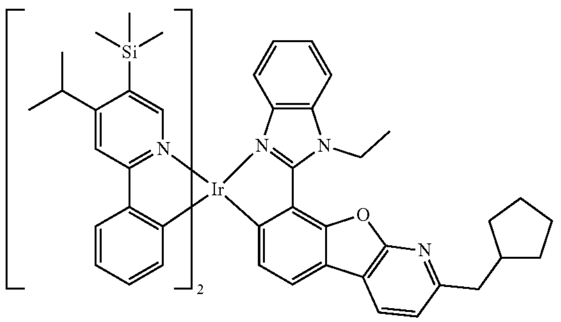
384
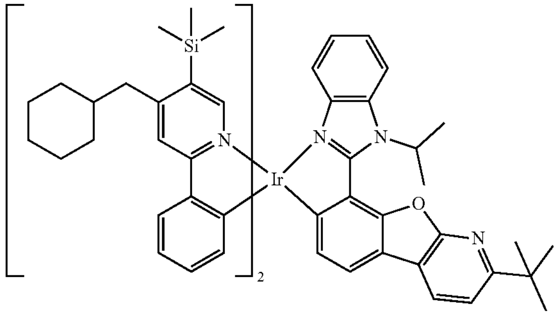
385
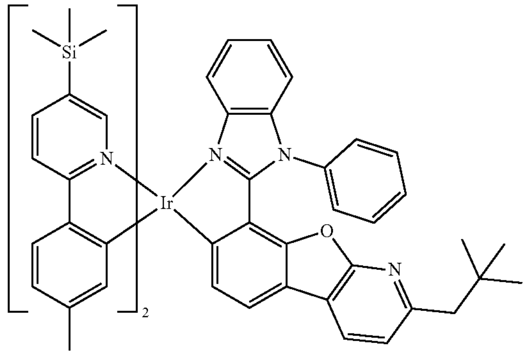
386
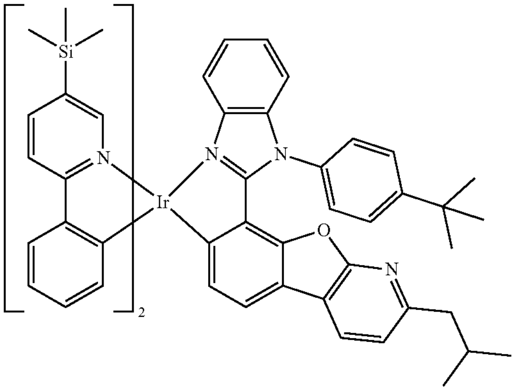

-continued
387
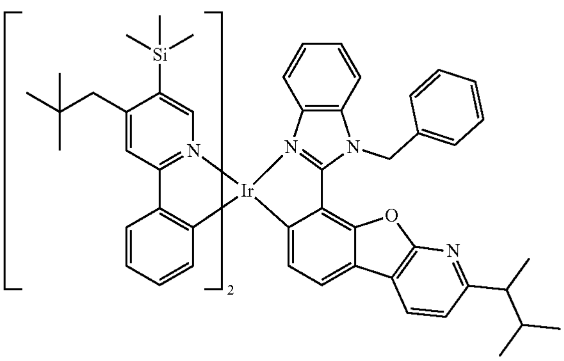
388
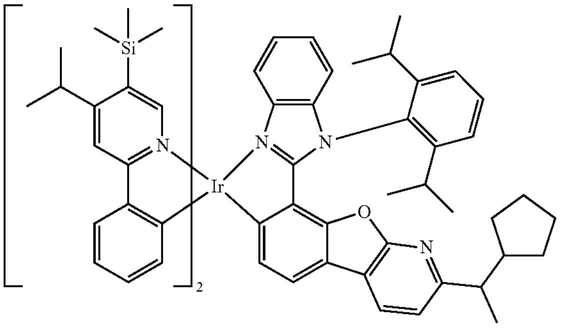
389
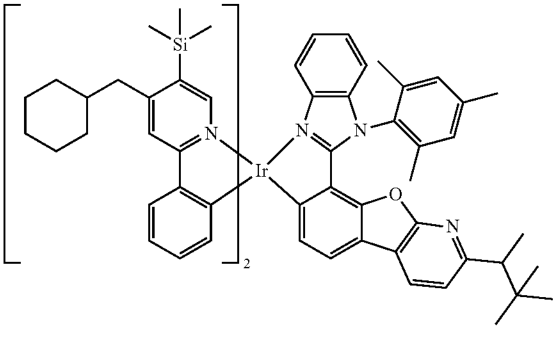
390
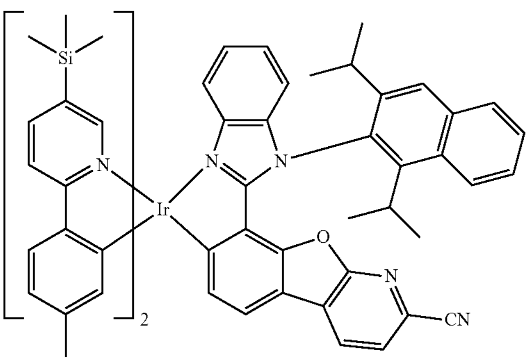
-continued
391
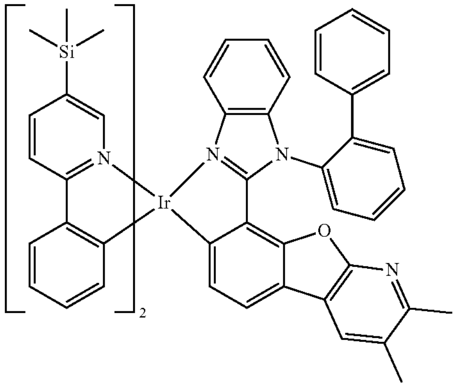
392
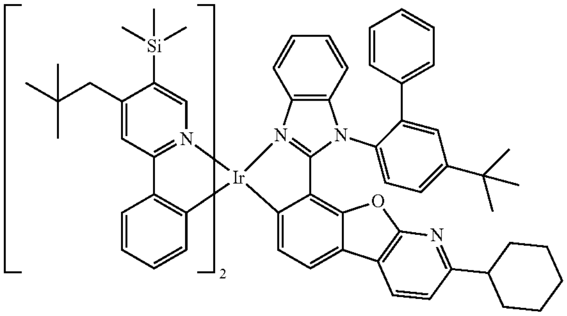
393
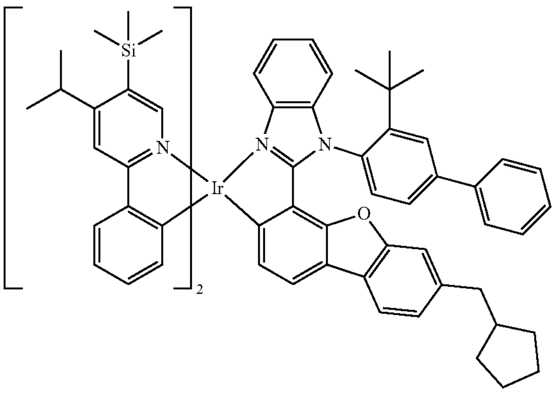
394
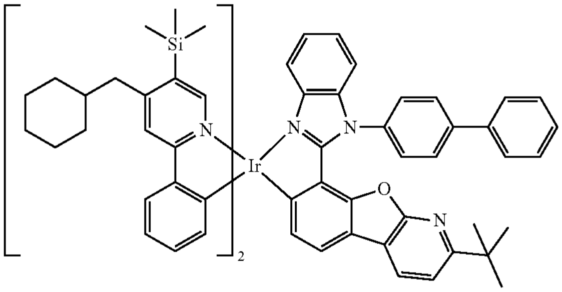

-continued
395
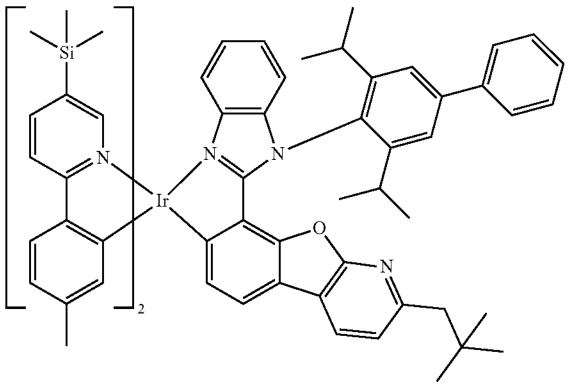
396
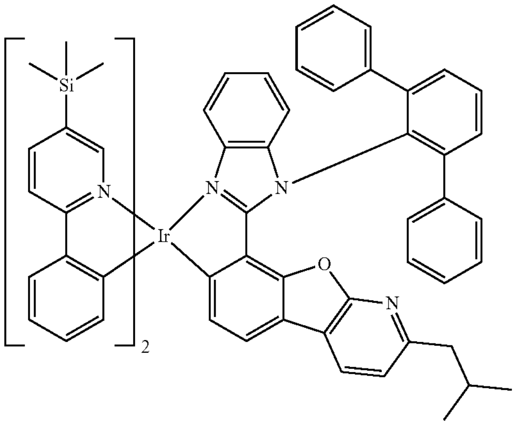
397
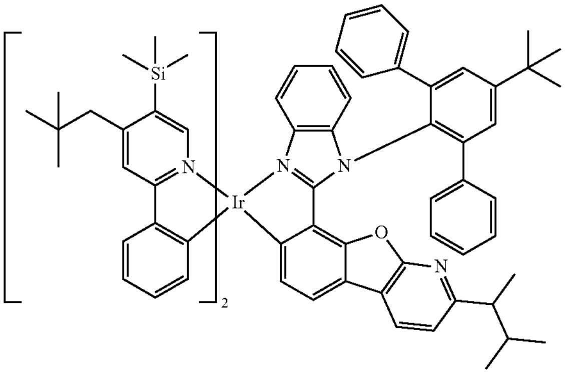
-continued
398
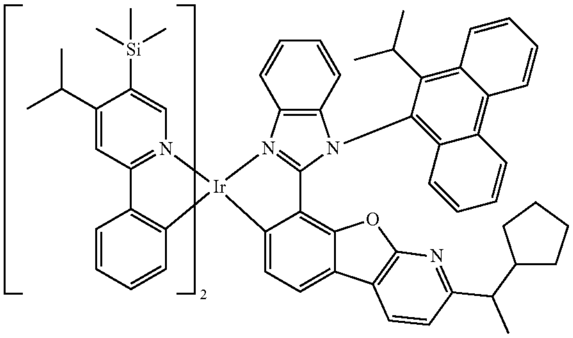
399
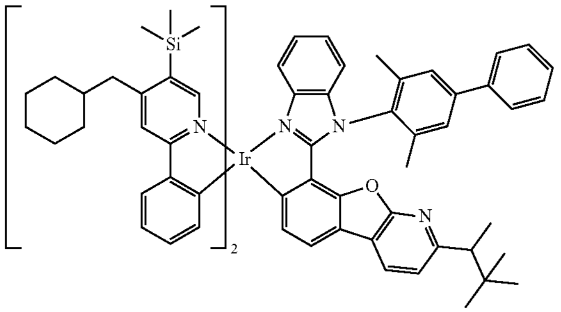
400
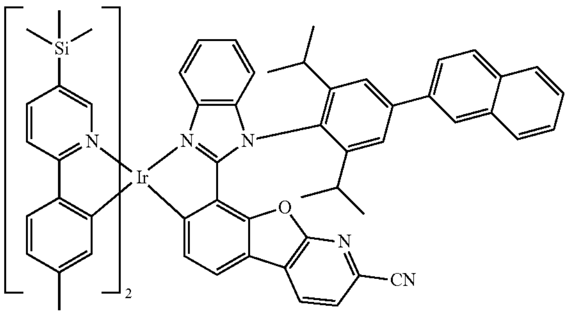
401
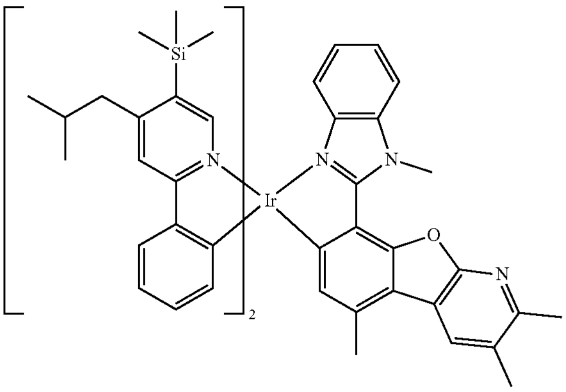

-continued
402
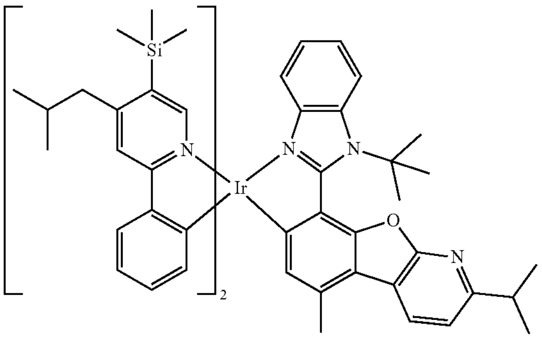
403
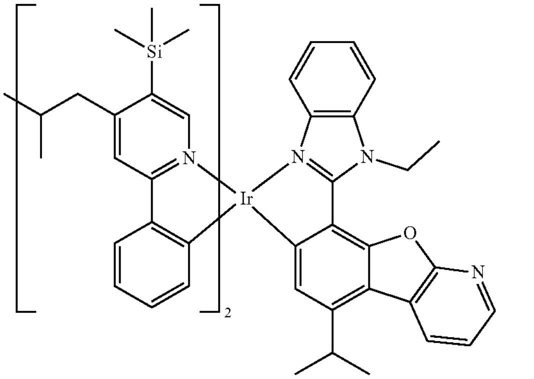
404
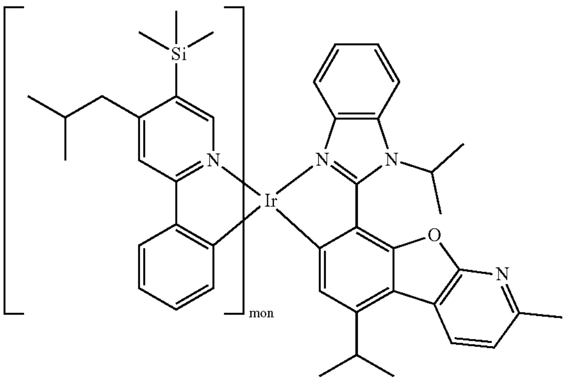
405
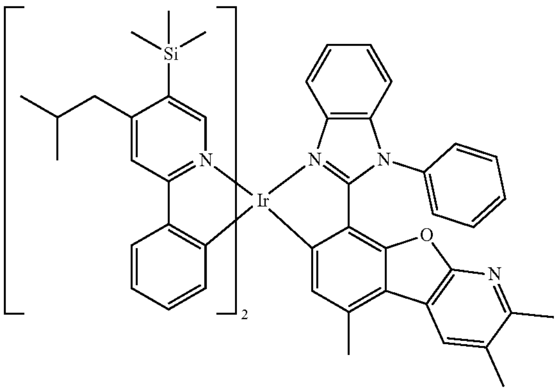
-continued
406
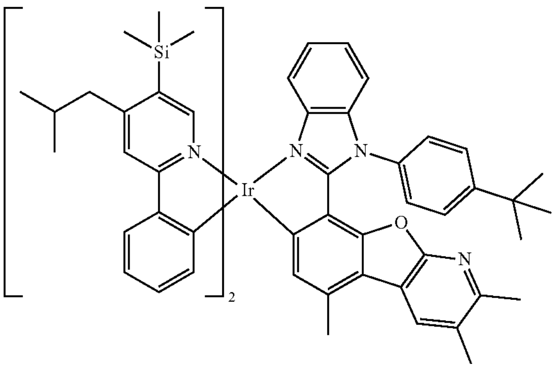
407
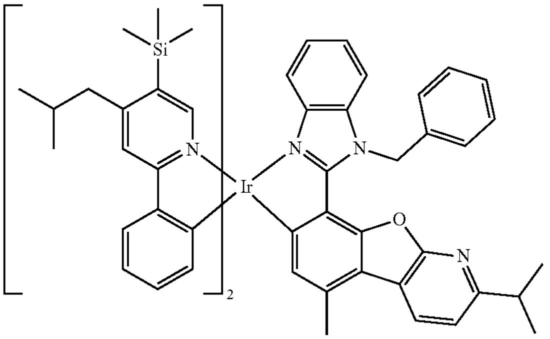
408
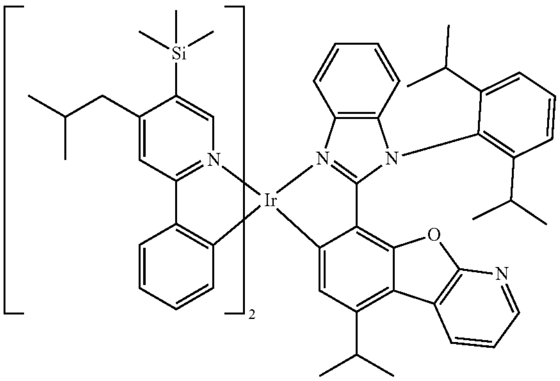
409
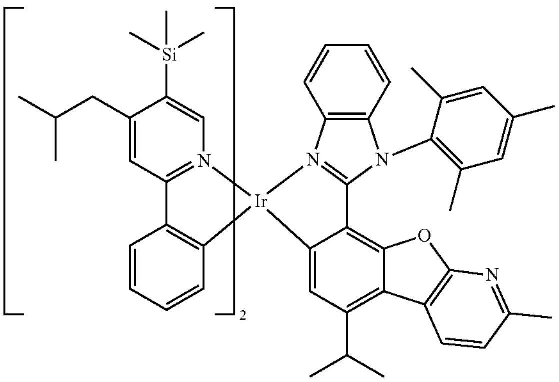

-continued
410
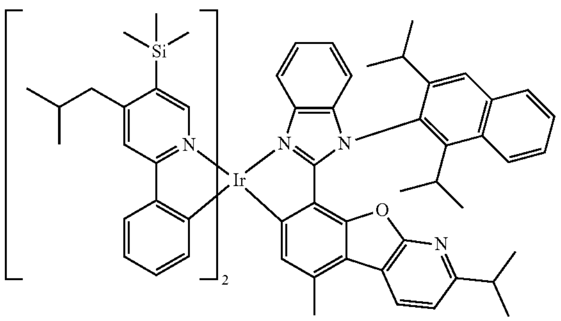
411
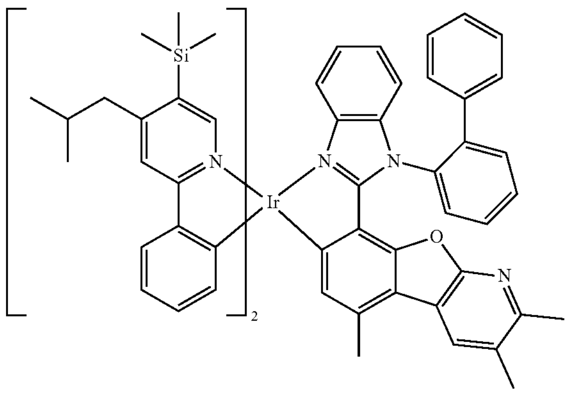
412
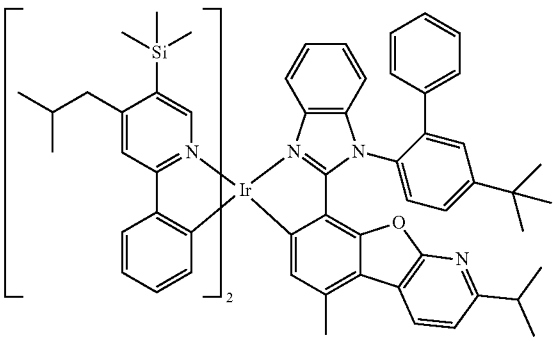
413
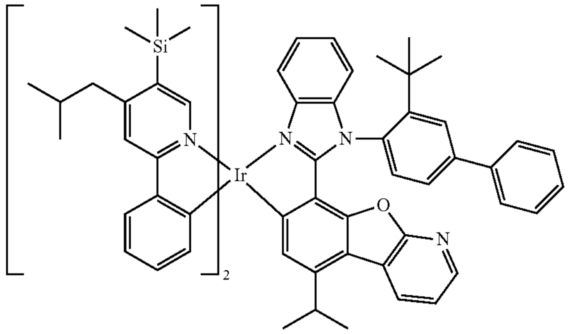
-continued
414
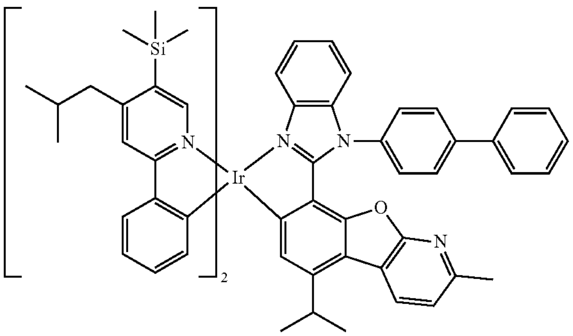
415
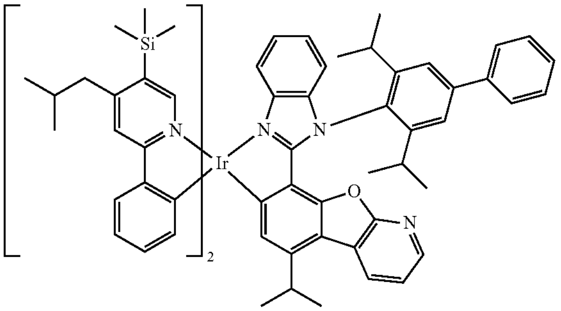
416
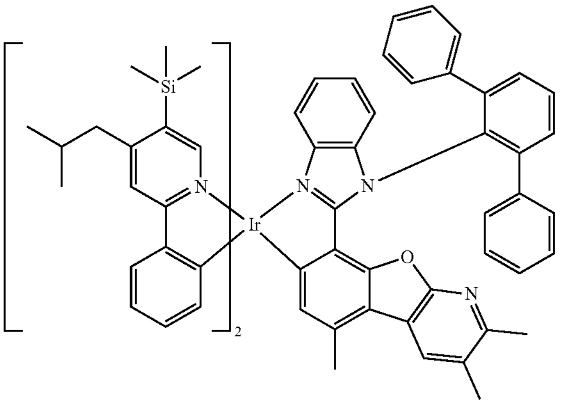
417
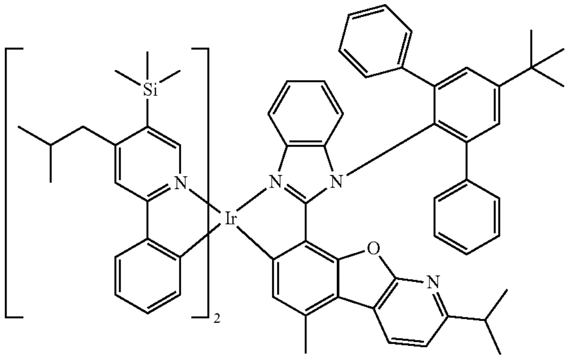

418
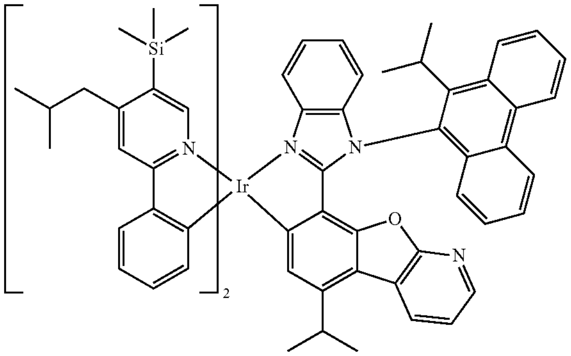
419
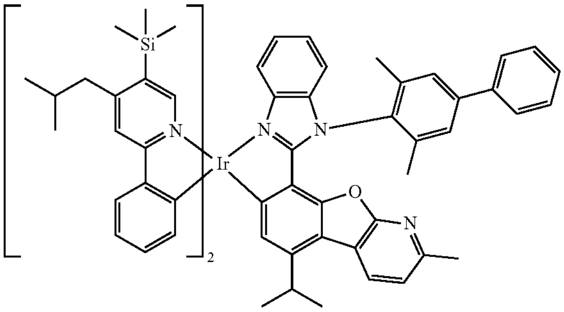
420
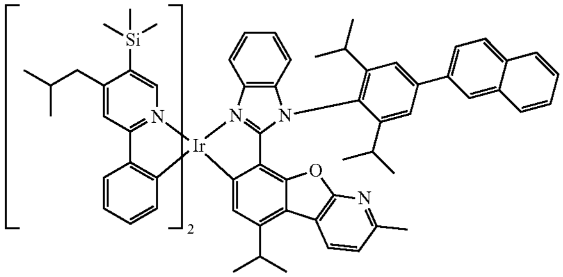
421
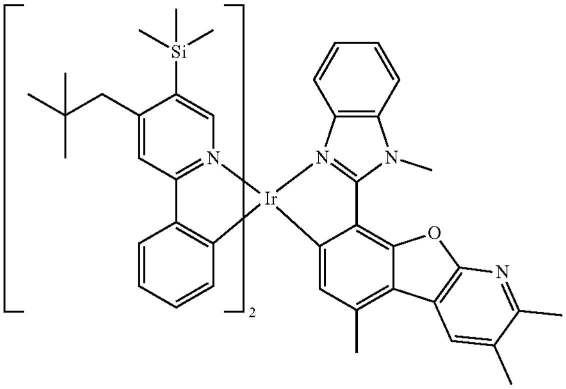
422
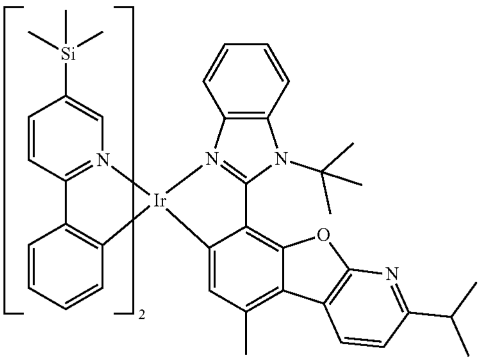
423
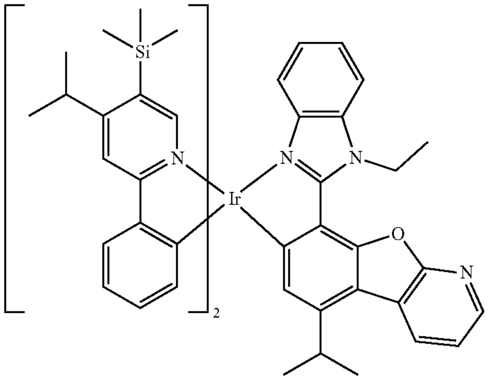
424
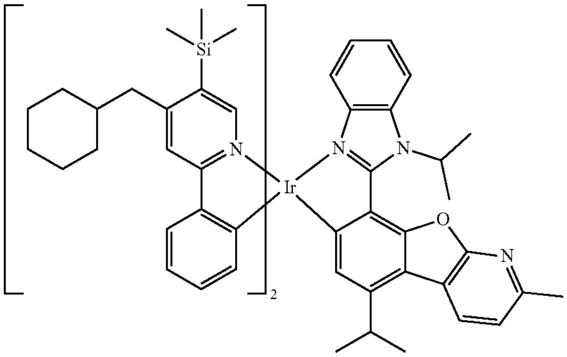
425
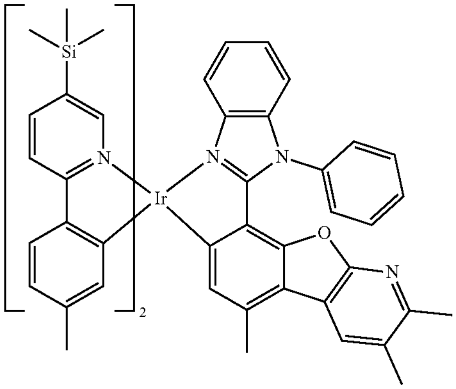

-continued
426
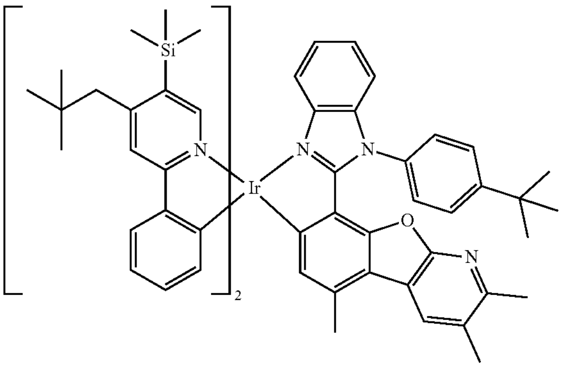
427
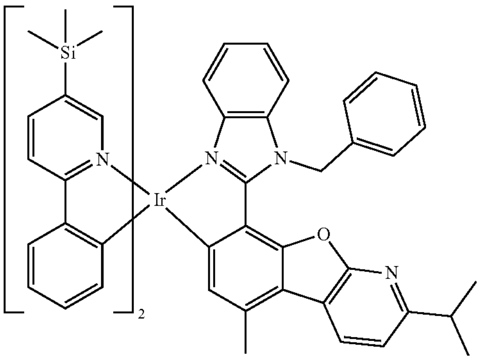
428
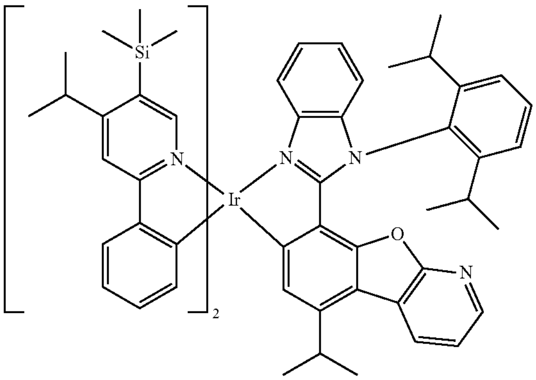
429
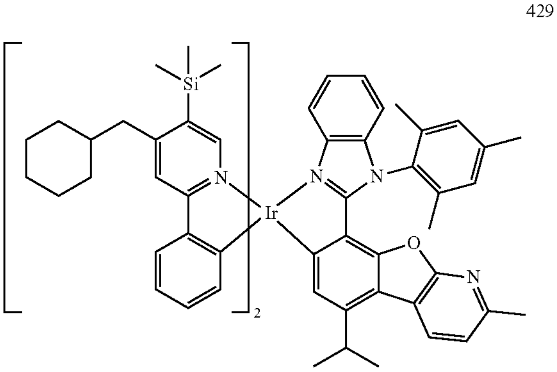
-continued
430
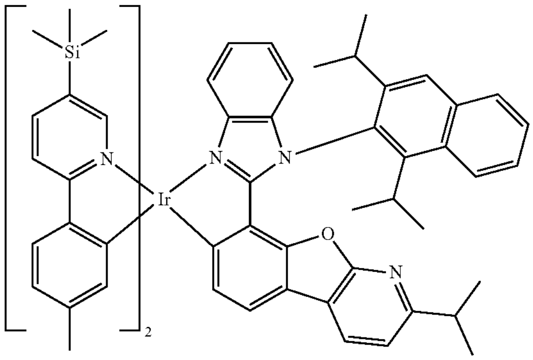
431
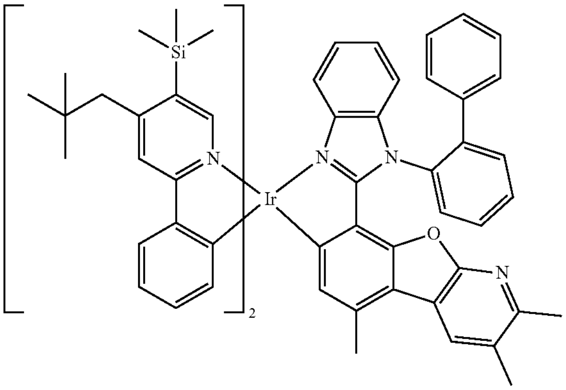
432
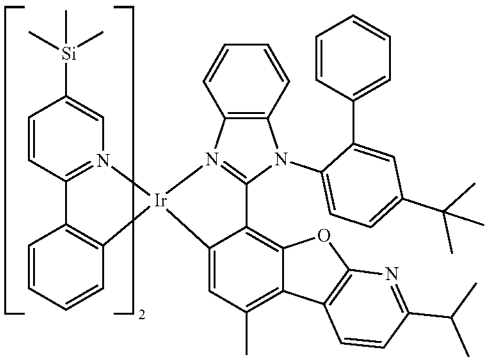
433
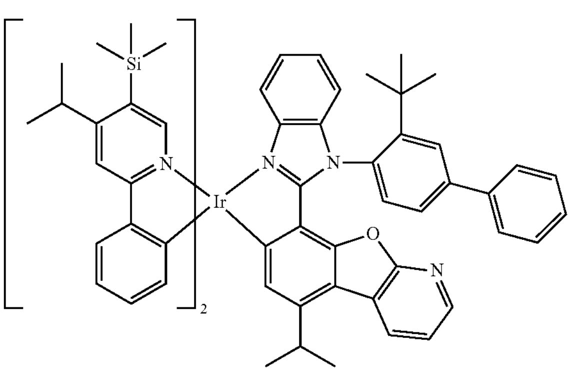

434
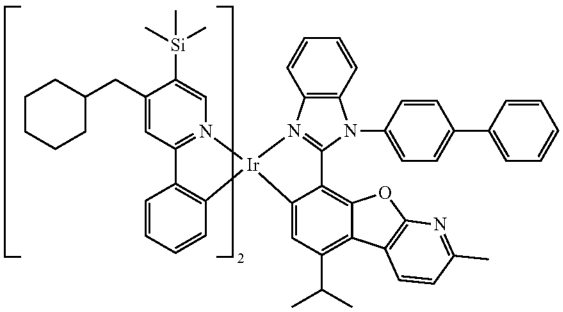
435
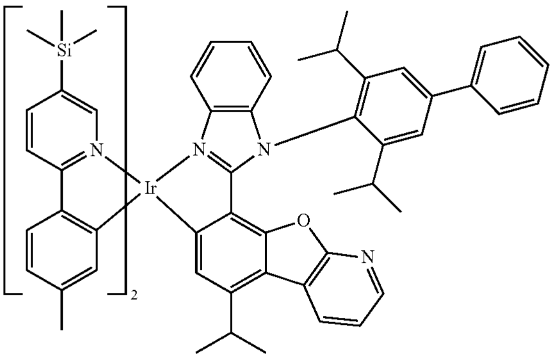
436
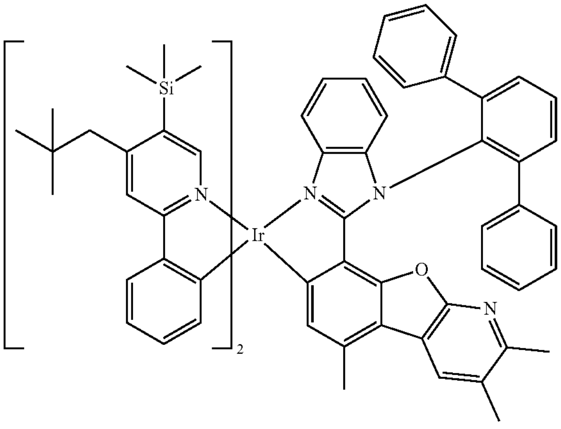
437
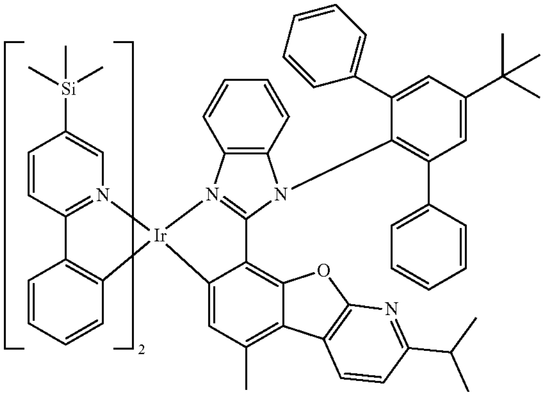
438
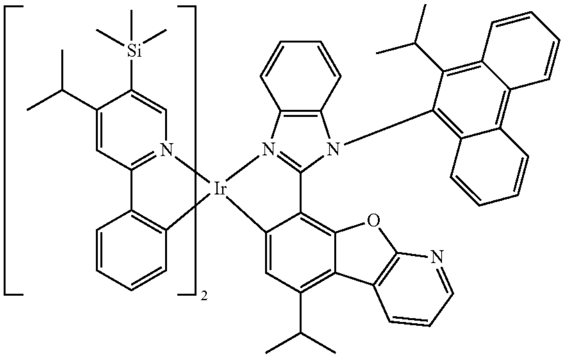
439
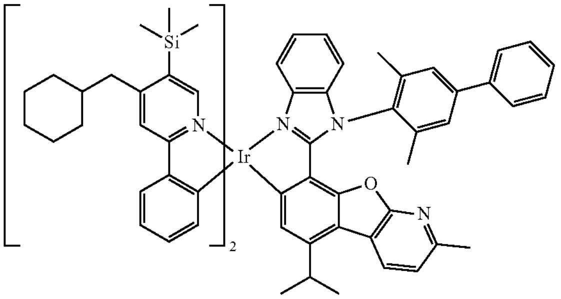
440
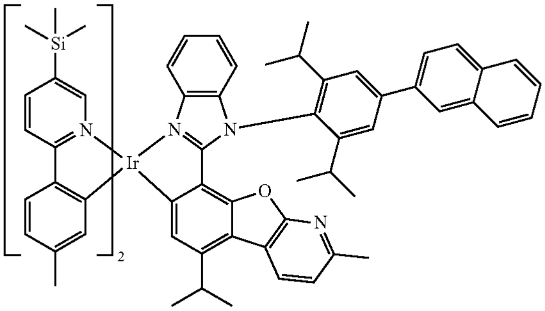
441
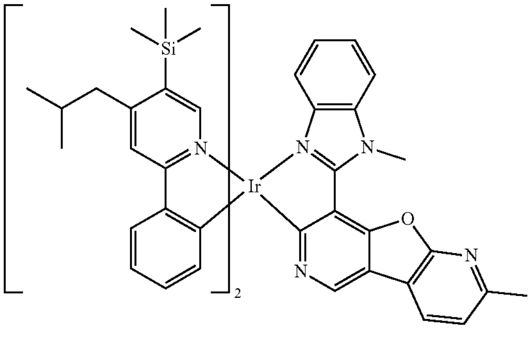

-continued
442
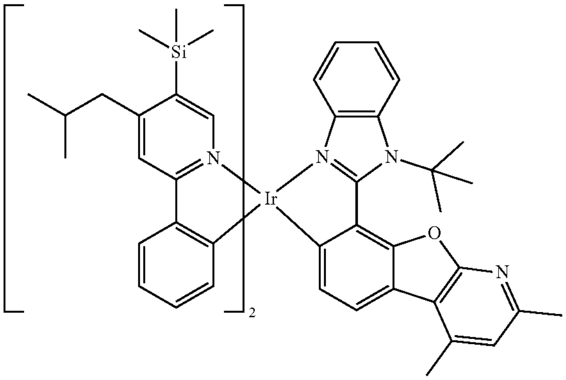
443
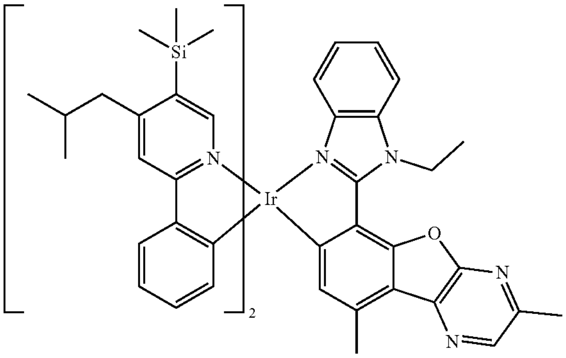
444
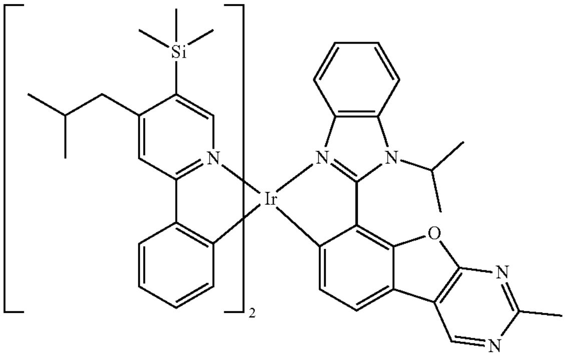
445
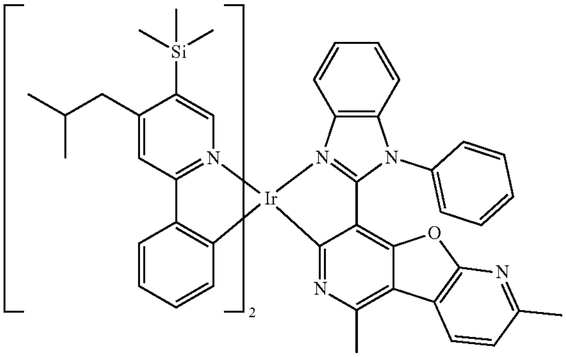
-continued
446
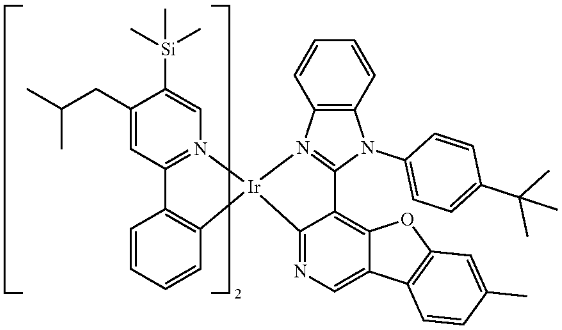
447
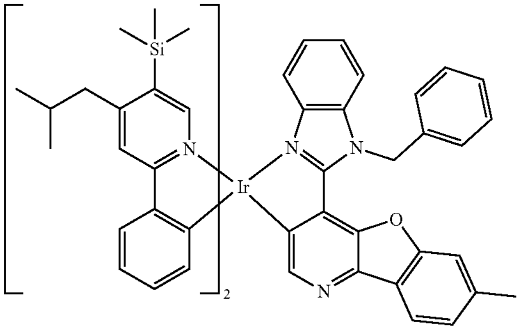
448
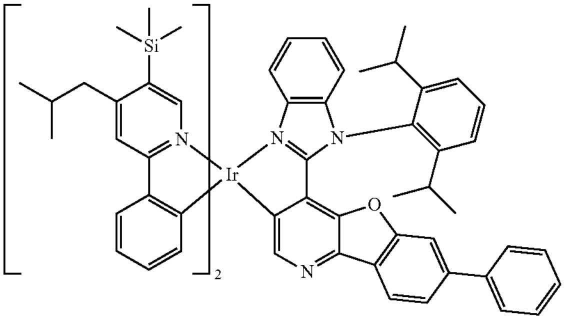
449
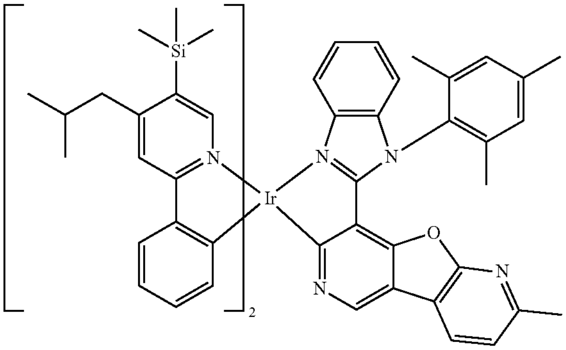

-continued
450
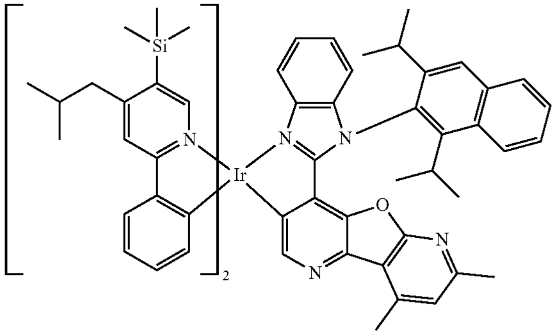
451
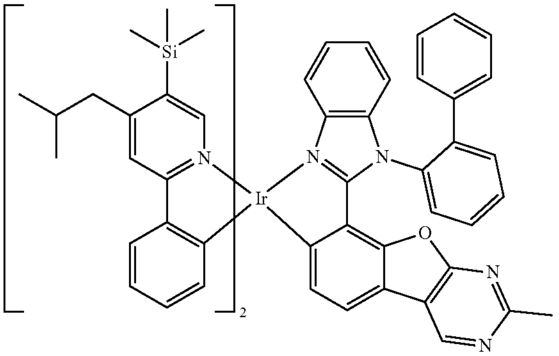
452
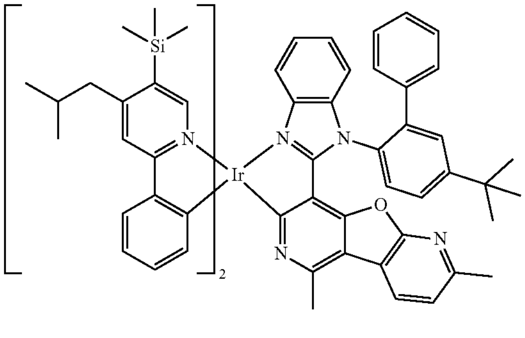
453
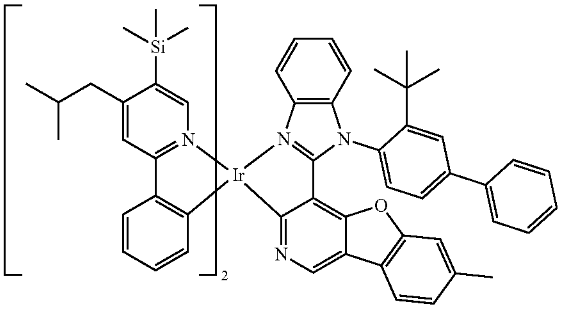
-continued
454
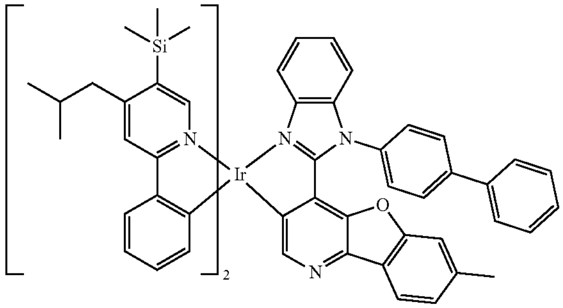
455
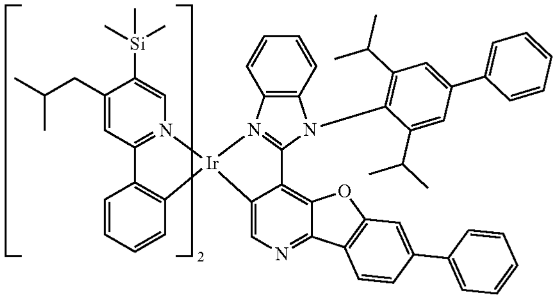
456
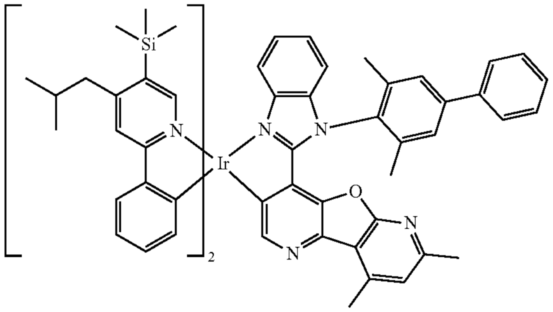
457
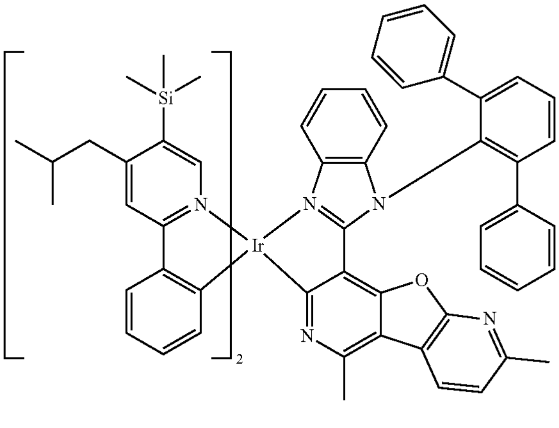

-continued
458
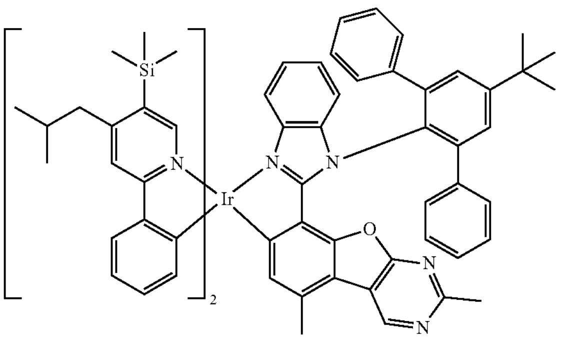
459
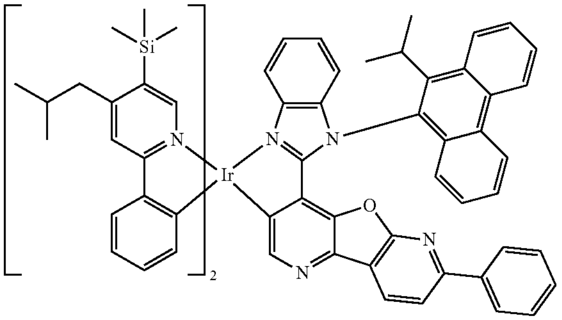
460
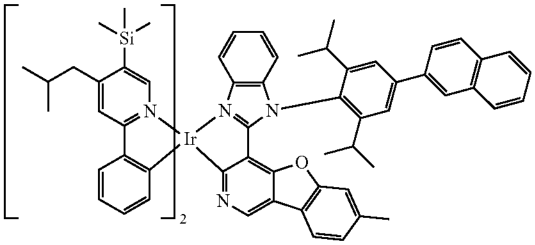
461
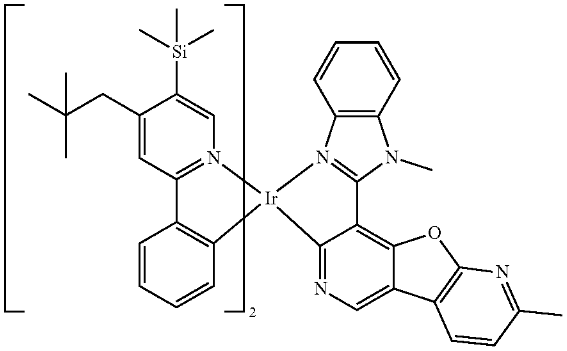
-continued
462
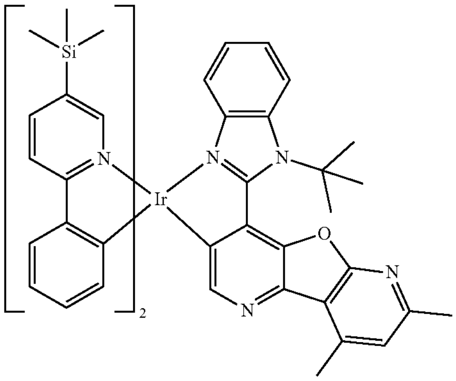
463
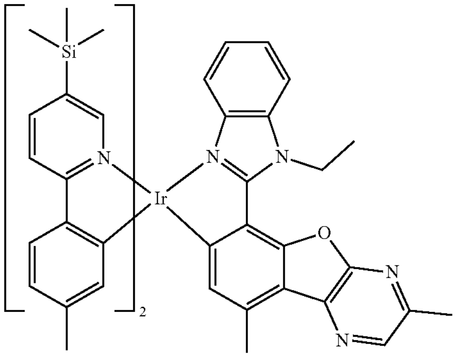
464
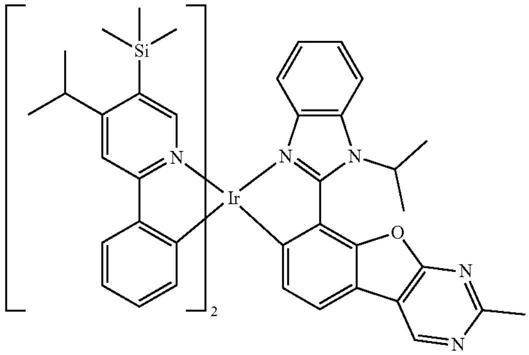
465
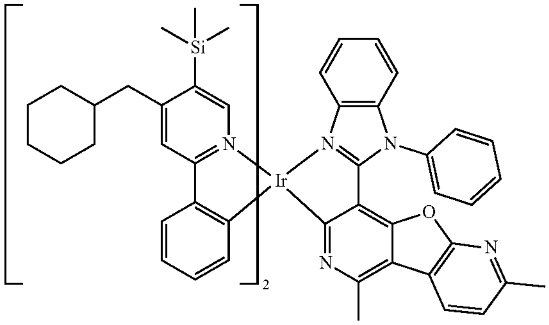

-continued
466
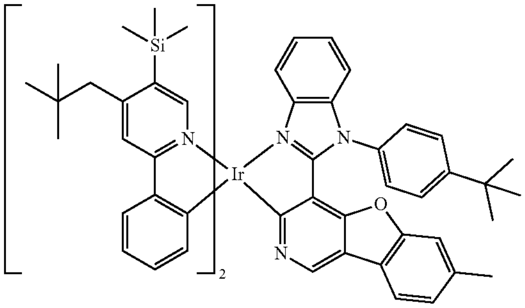
467
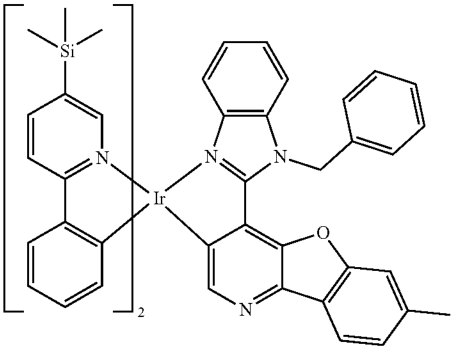
468
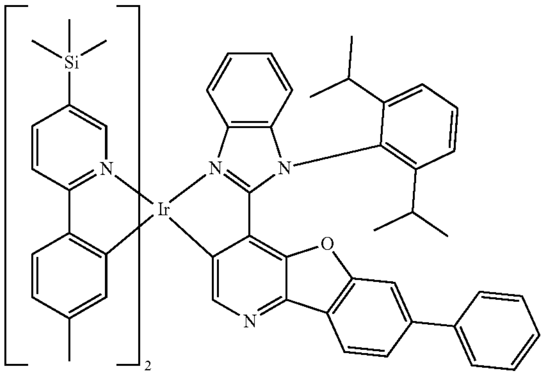
469
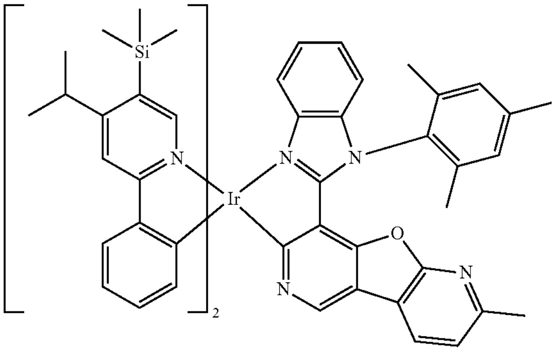
-continued
470
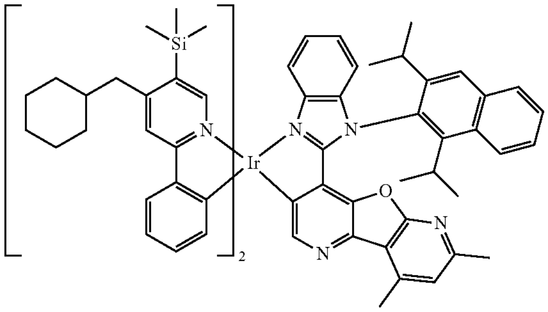
471
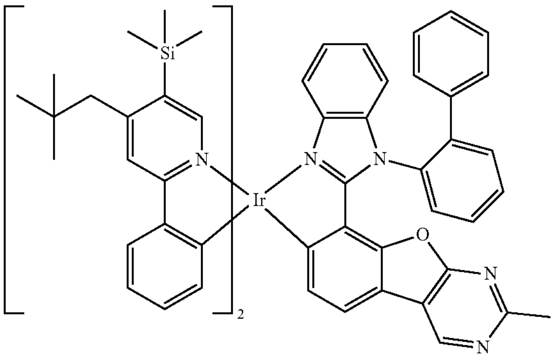
472
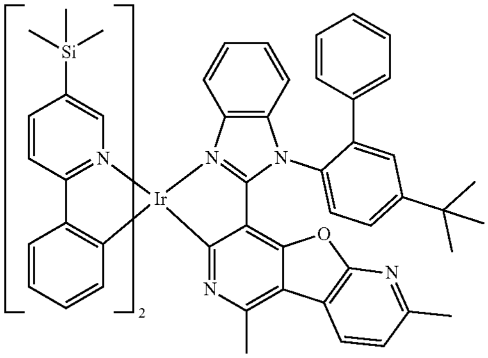
473
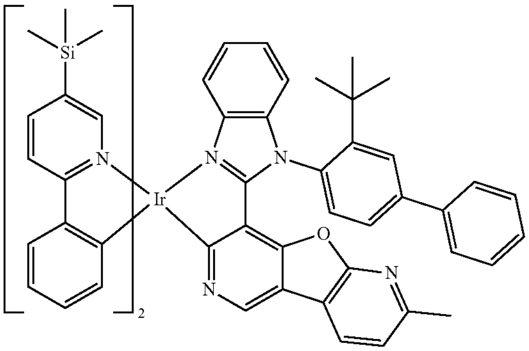

-continued
474
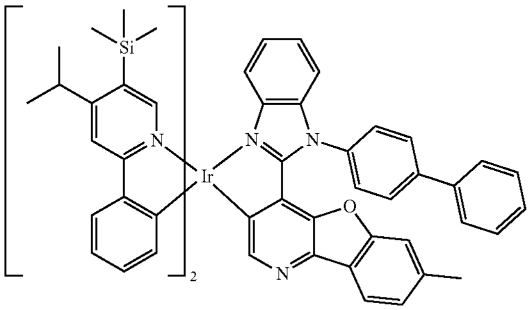
475
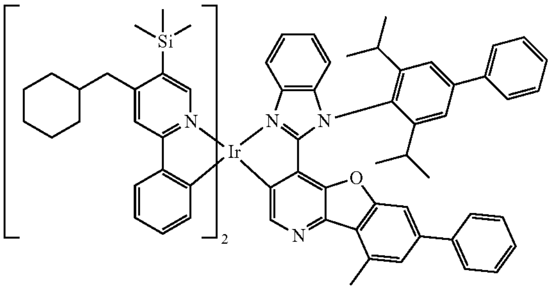
476
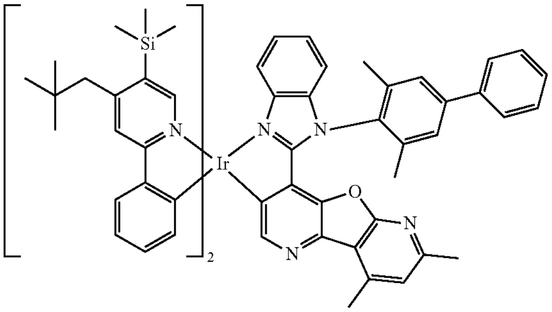
477
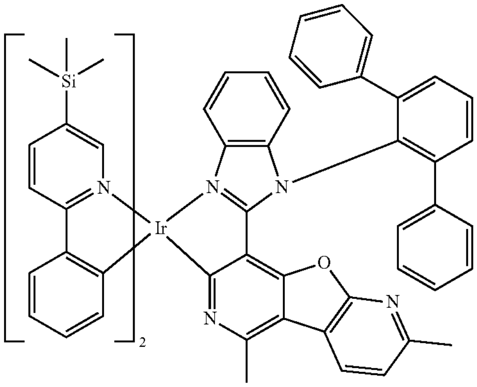
-continued
478
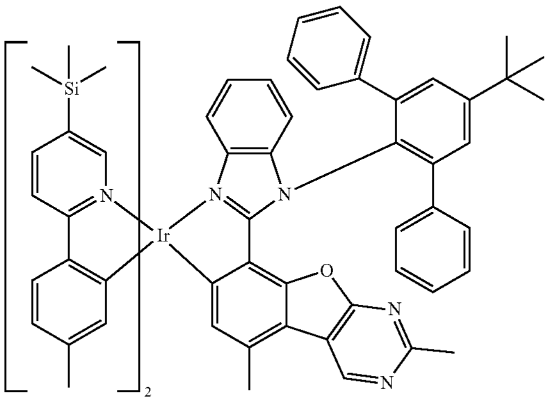
479
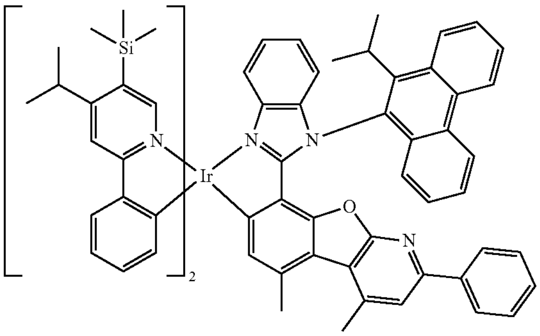
480
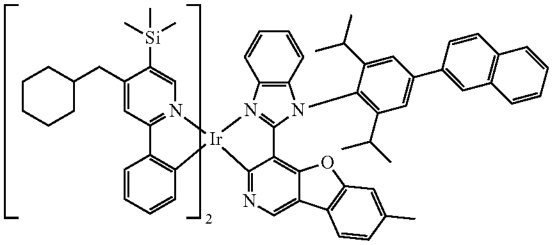
481
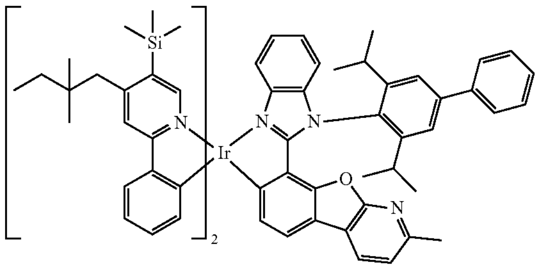
482
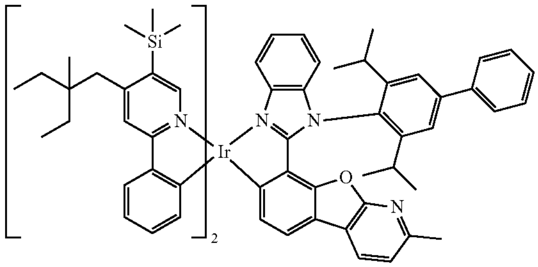

-continued
483
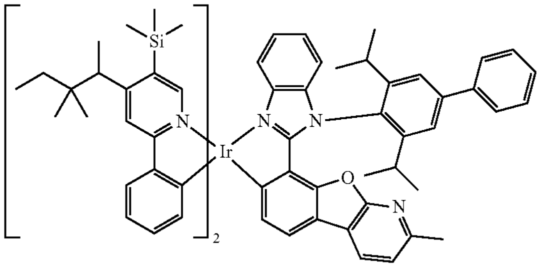
484
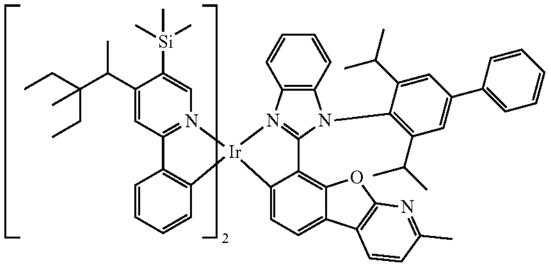
485
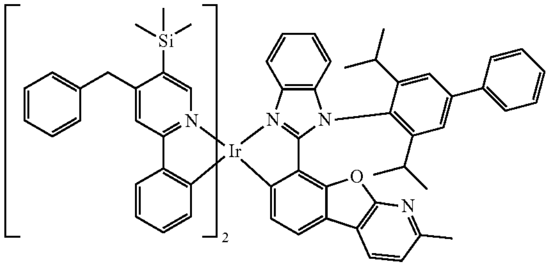
486
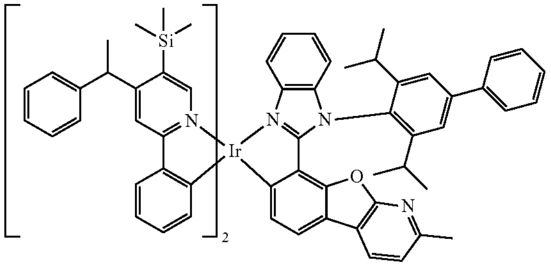
487
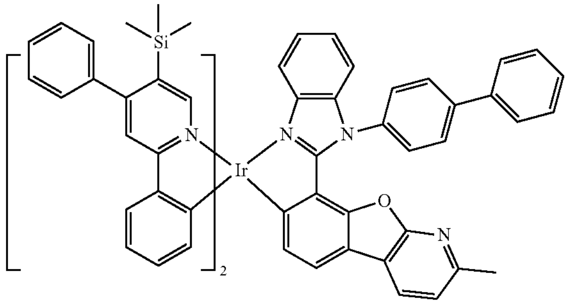
-continued
488
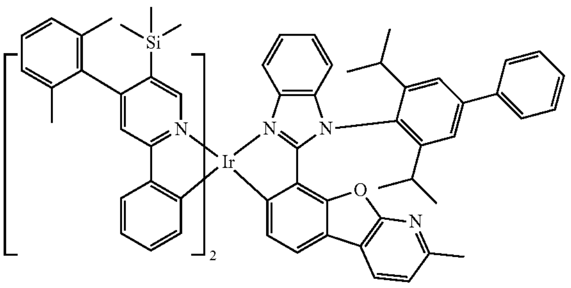
489
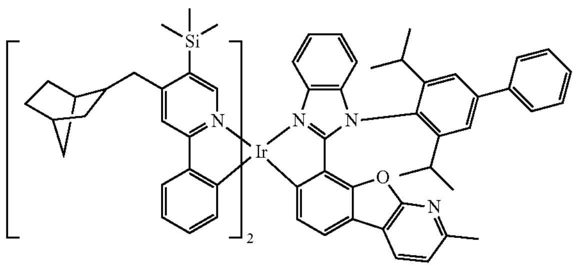
490
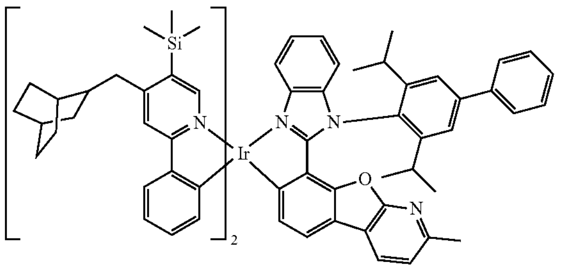
491
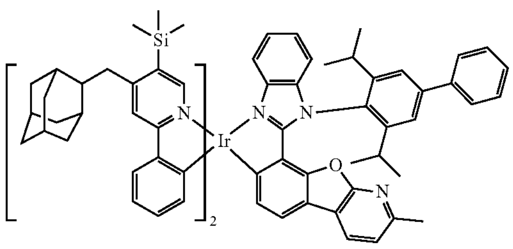
492
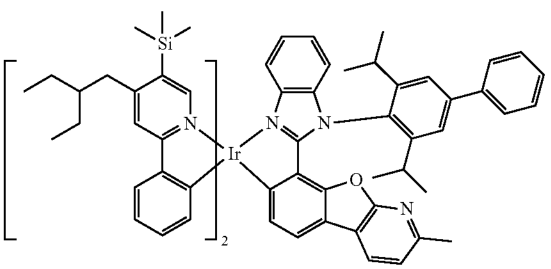

-continued
493
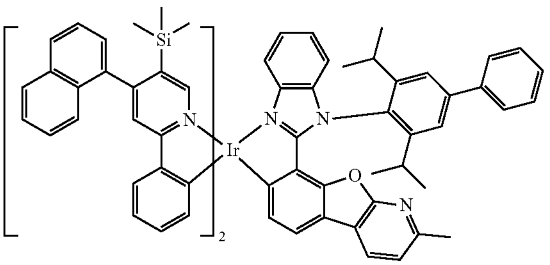
494
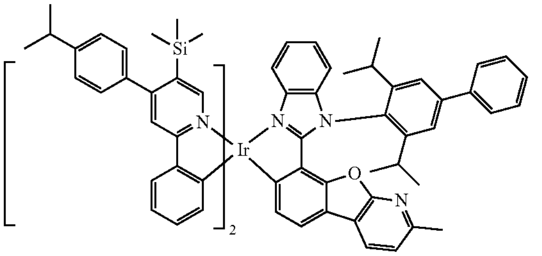
495
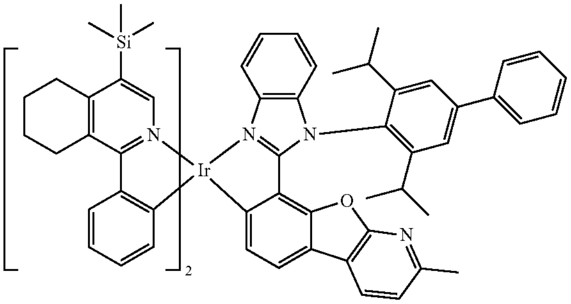
496
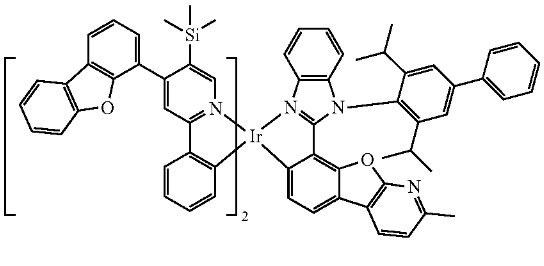
497
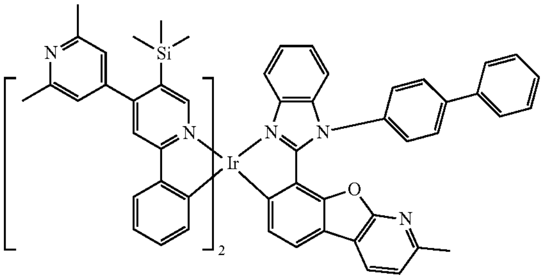
-continued
498
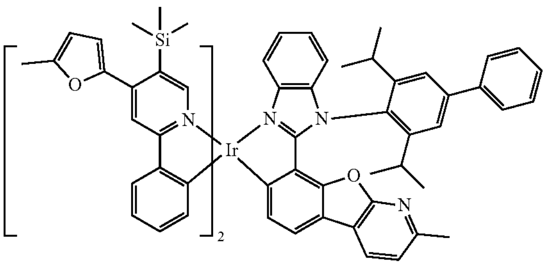
499
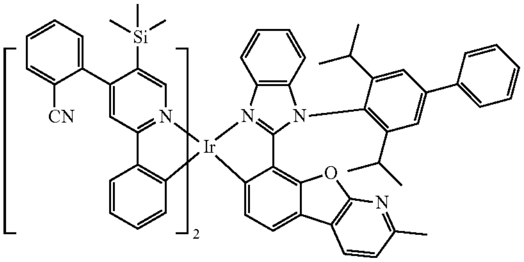
500
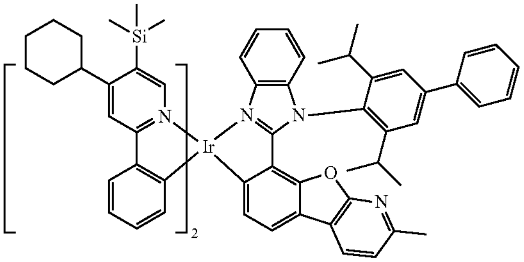
501
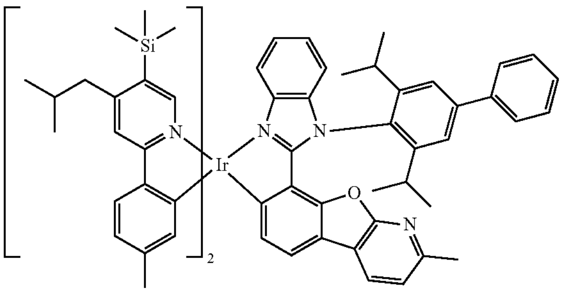
502
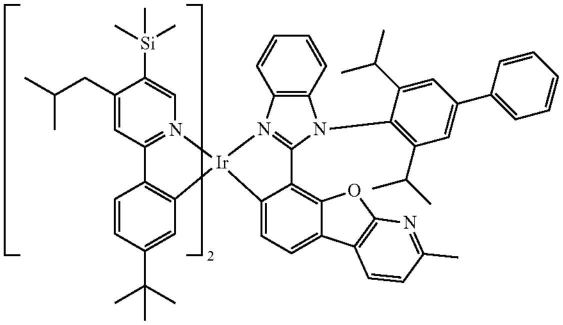

-continued
503
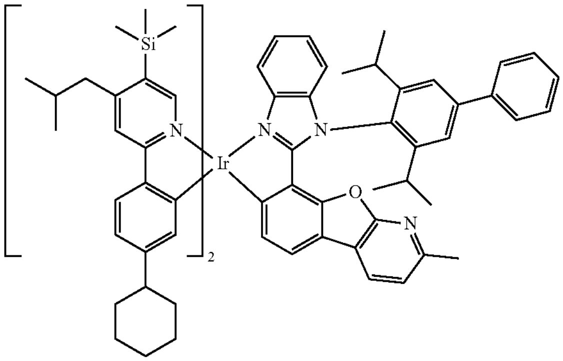
504
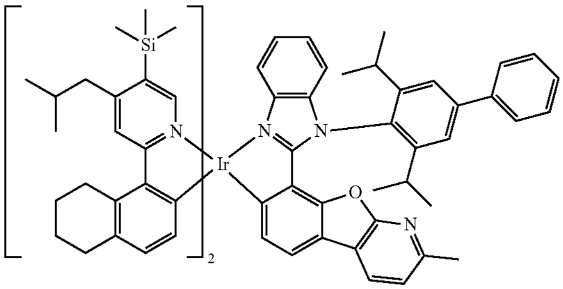
505
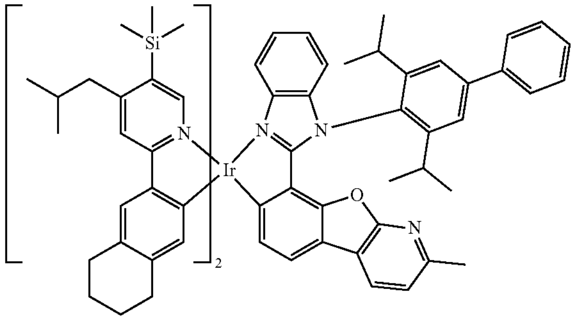
506
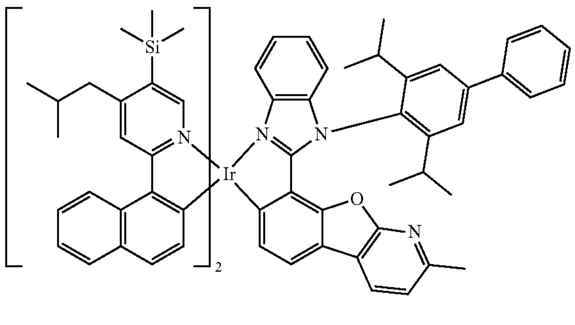
-continued
507
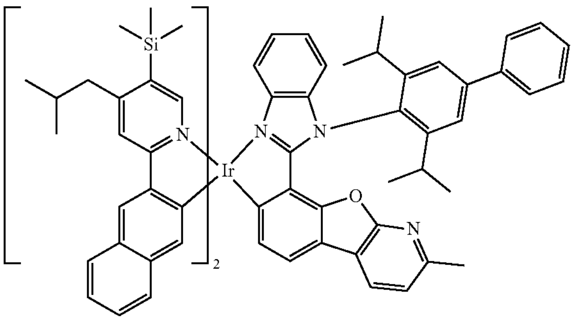
508
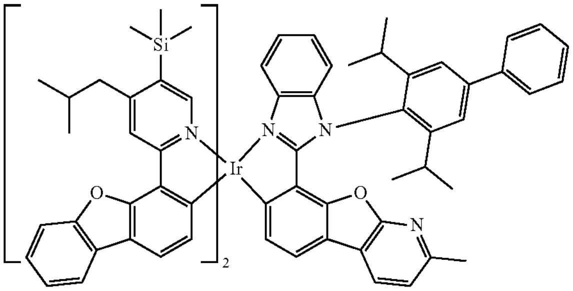
509
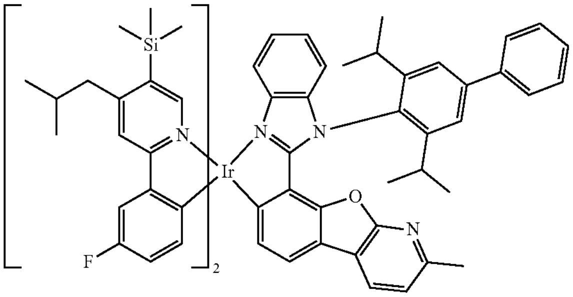
510
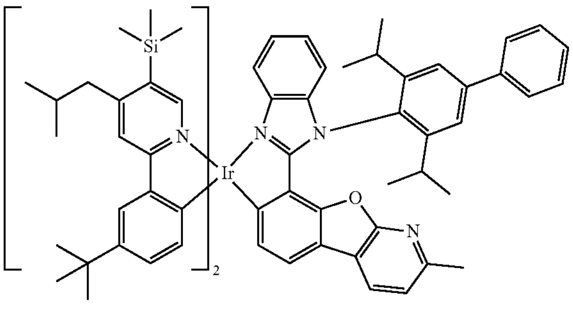

511
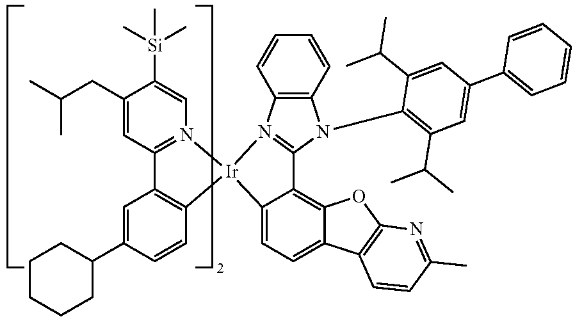
512
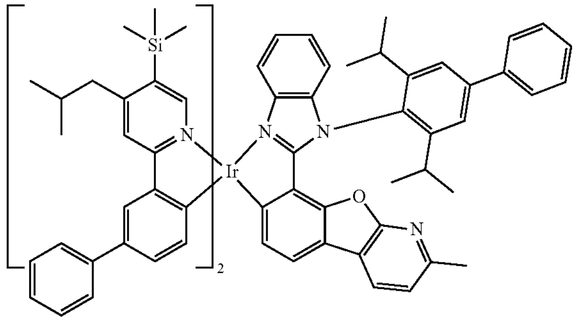
513
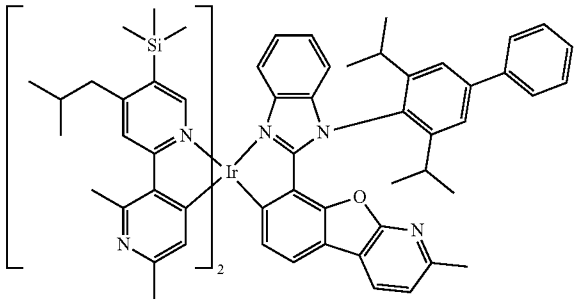
514
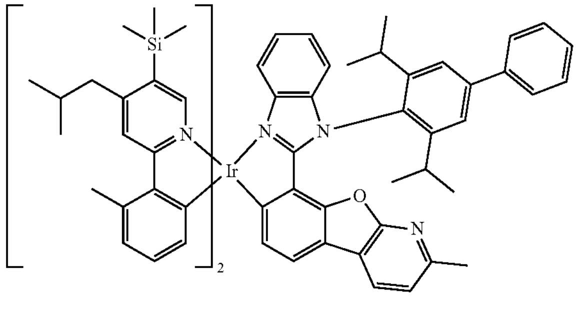
515
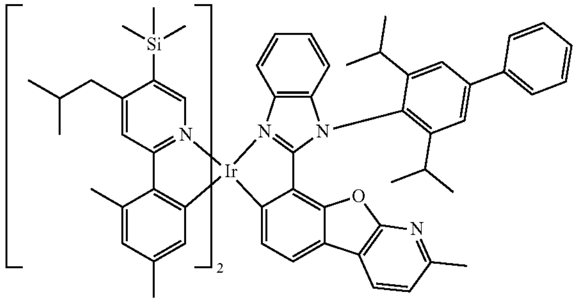
516
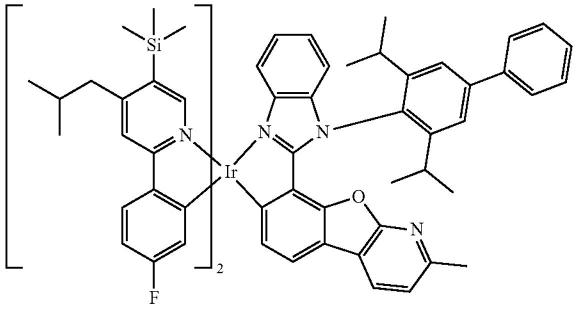
517
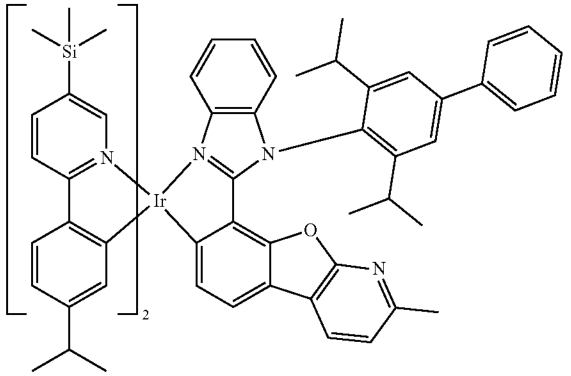
518
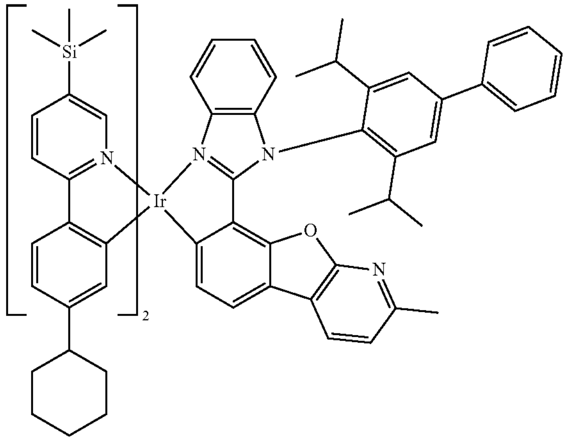

519
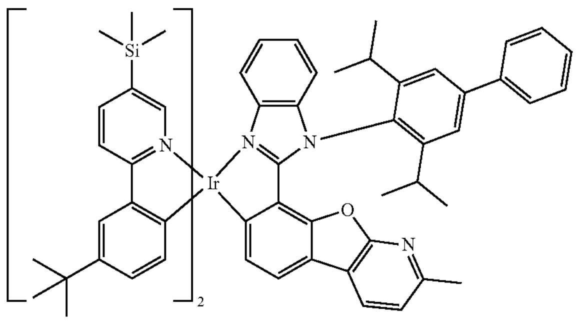
520
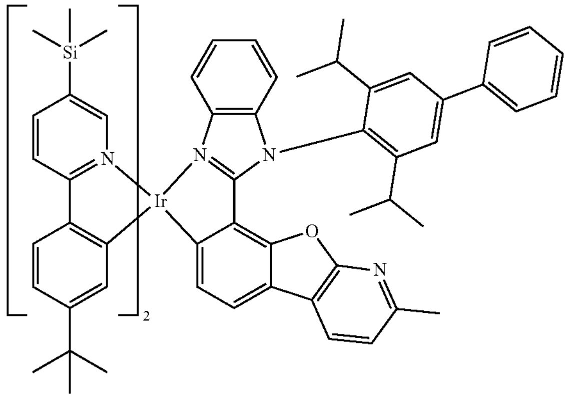
521
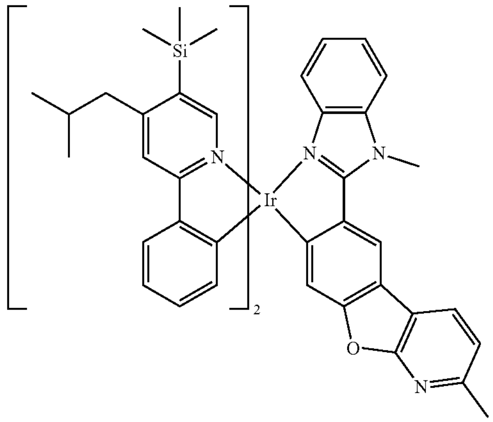
522
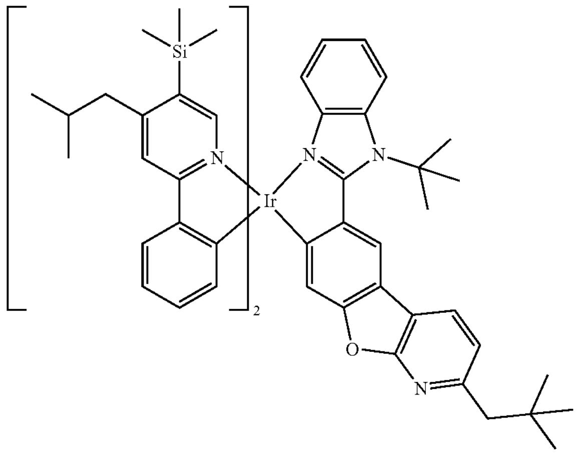
523
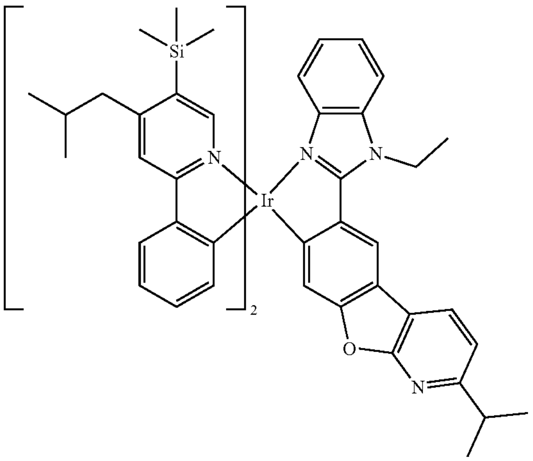
524
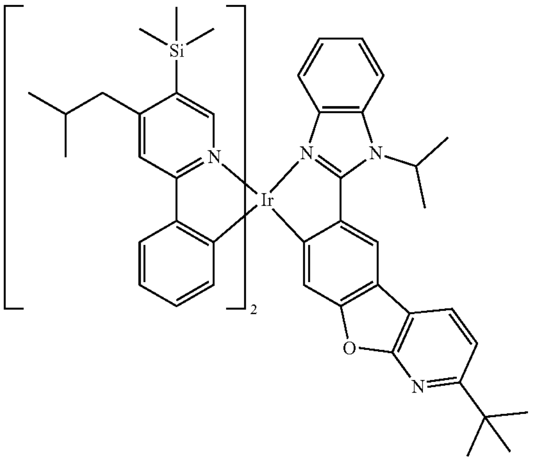
525
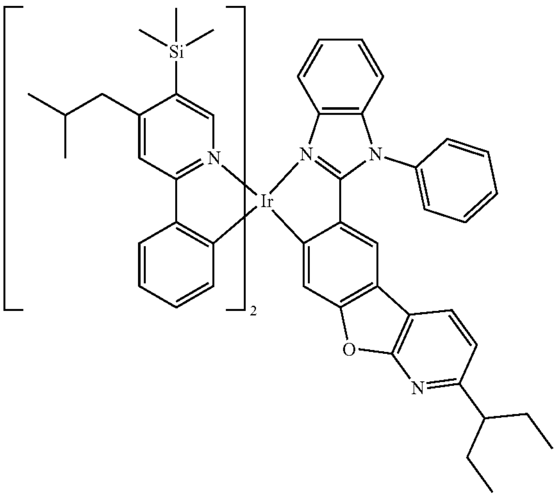

526
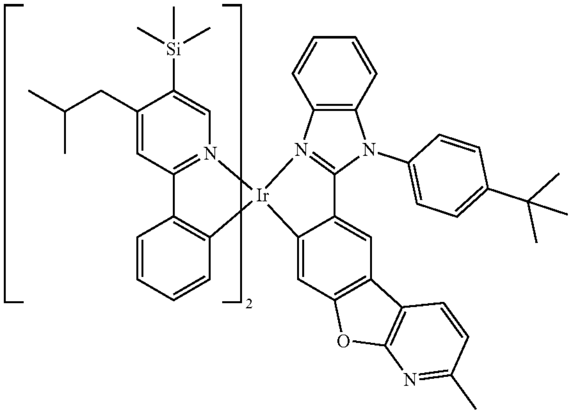
527
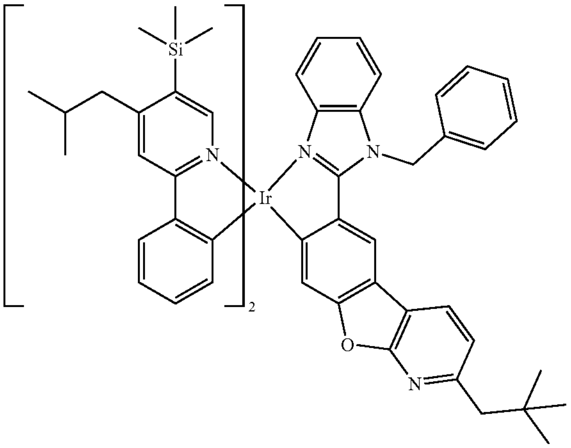
528
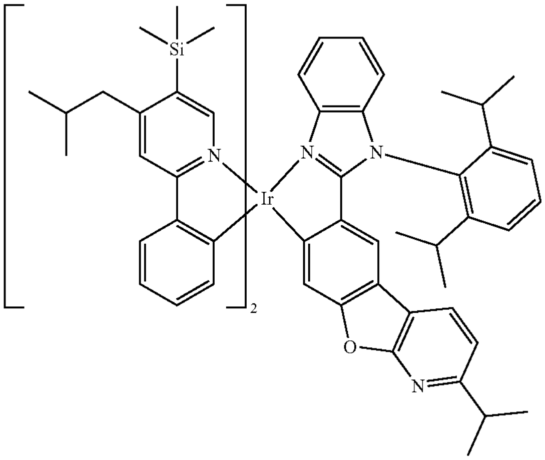
529
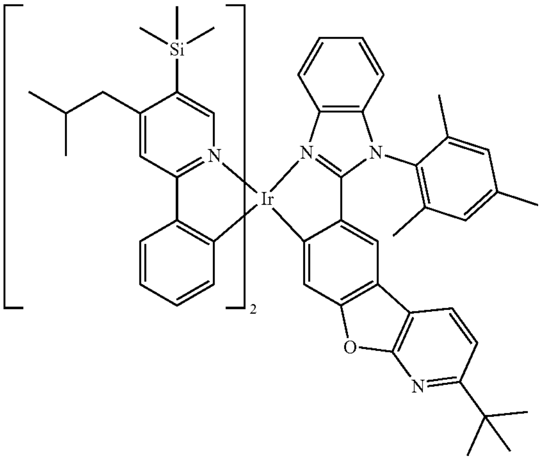
530
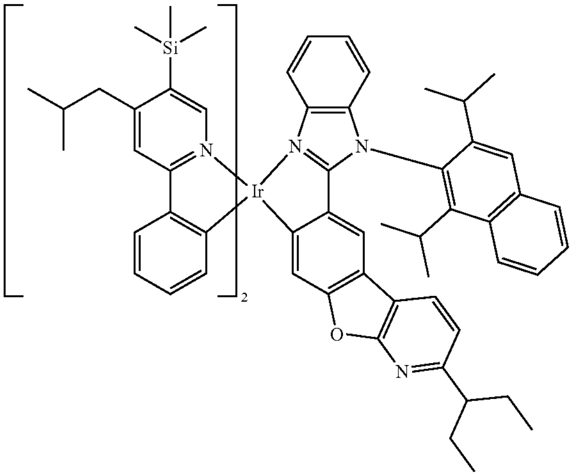
531
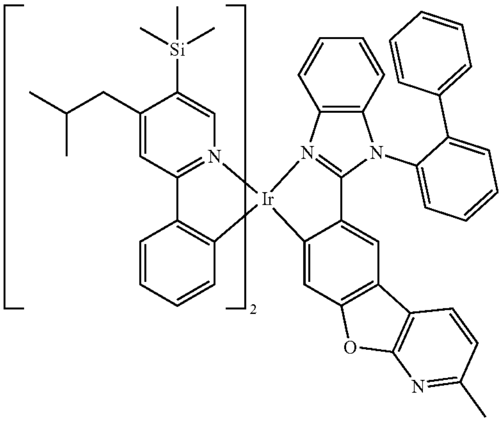

-continued
532
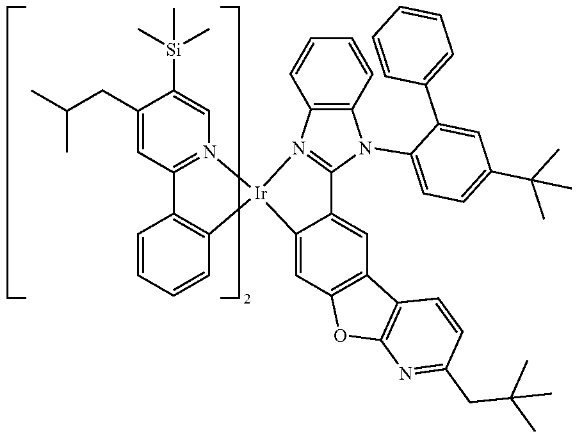
533
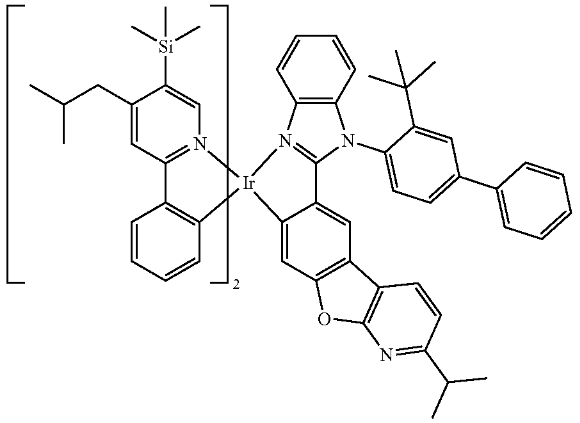
534
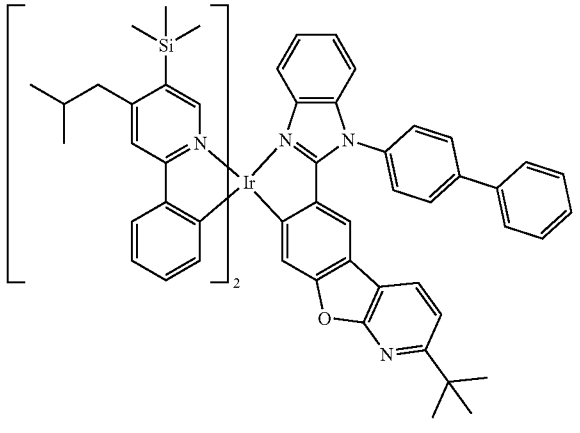
-continued
535
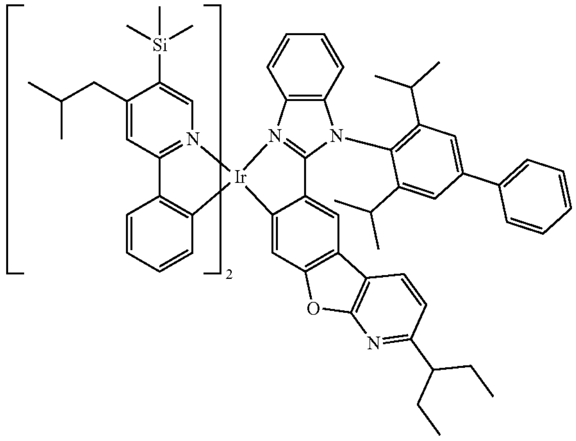
536
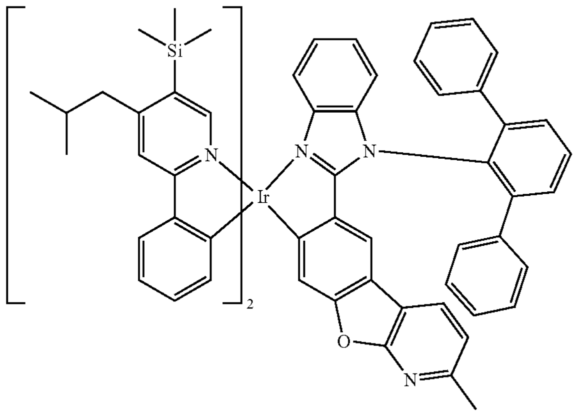
537
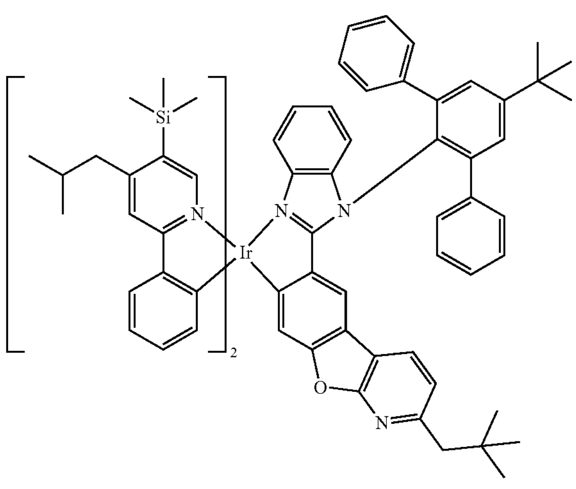

-continued
538
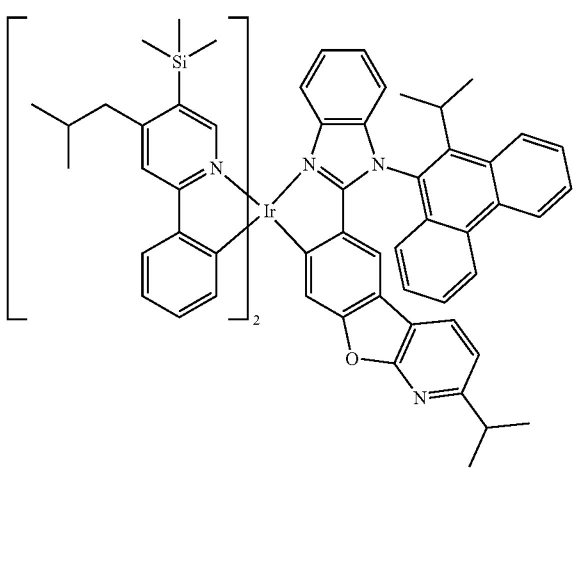
539
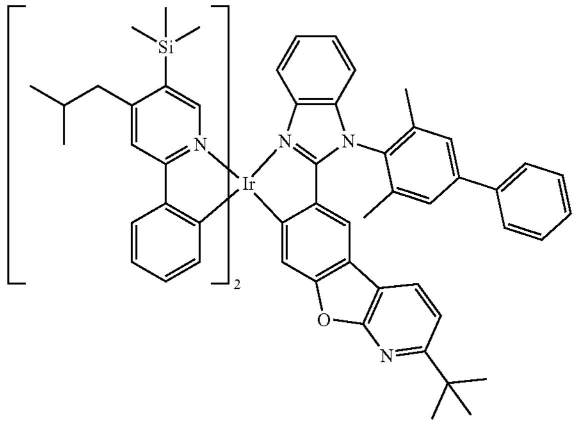
540
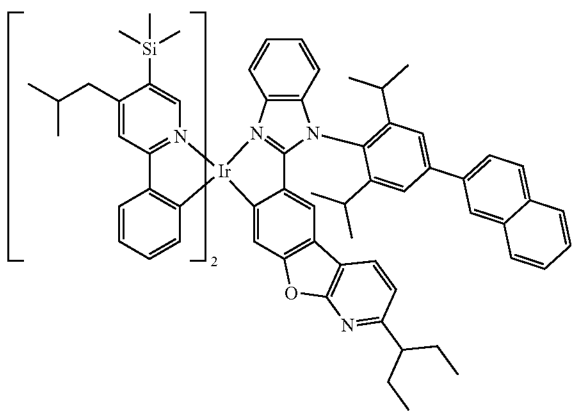
-continued
541
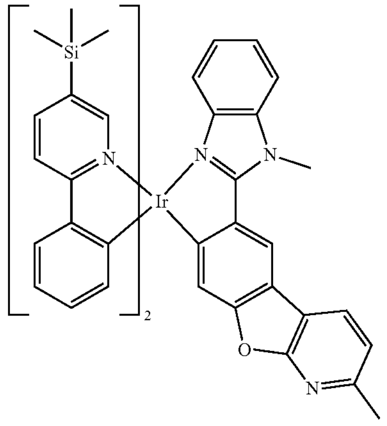
542
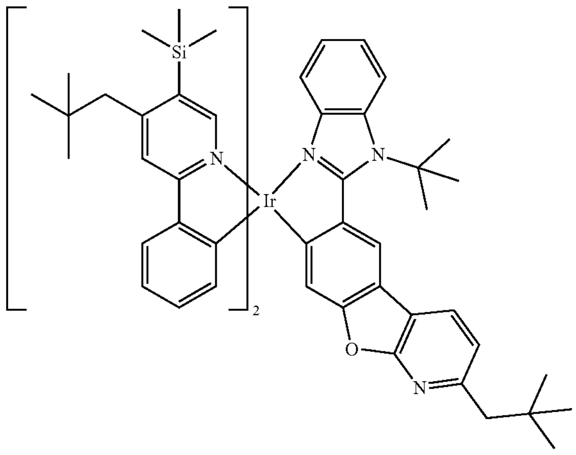
543
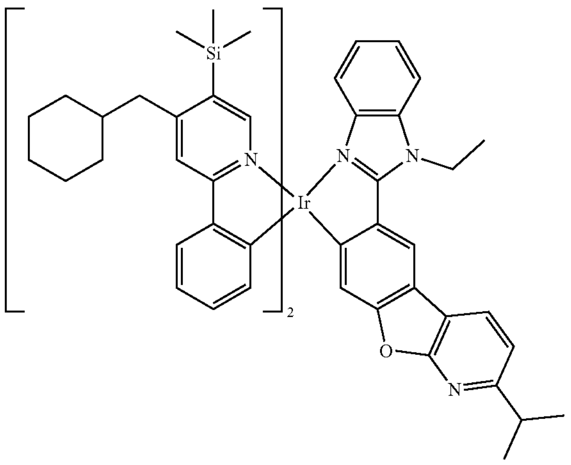

-continued
544
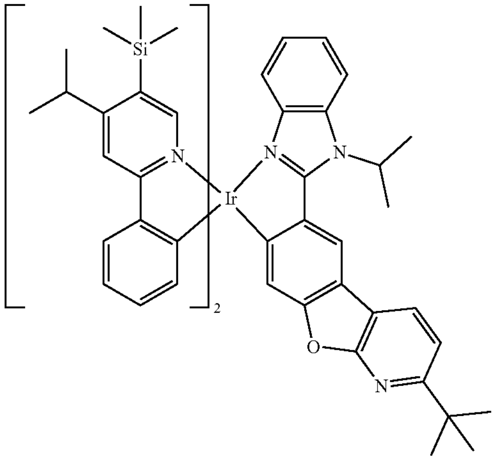
545
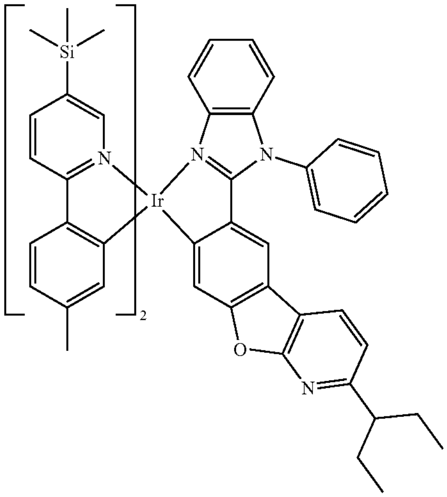
546
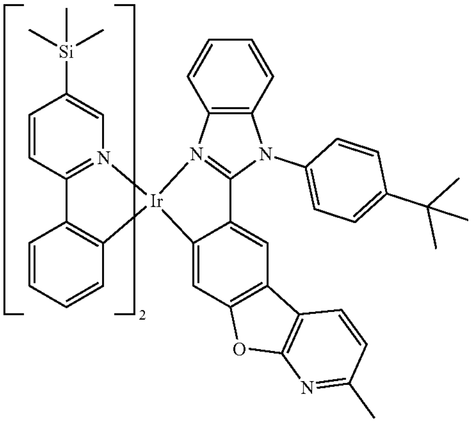
-continued
547
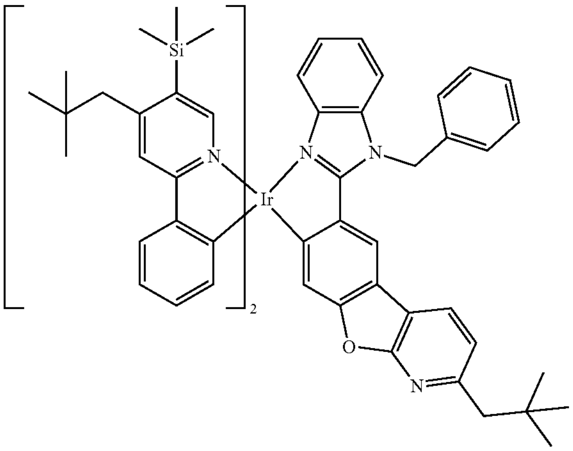
548
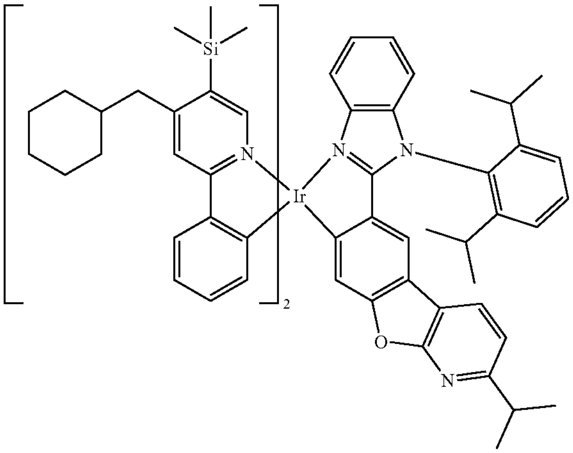
549
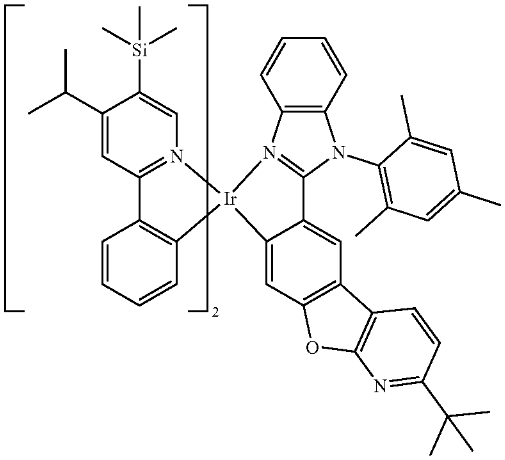

-continued
550
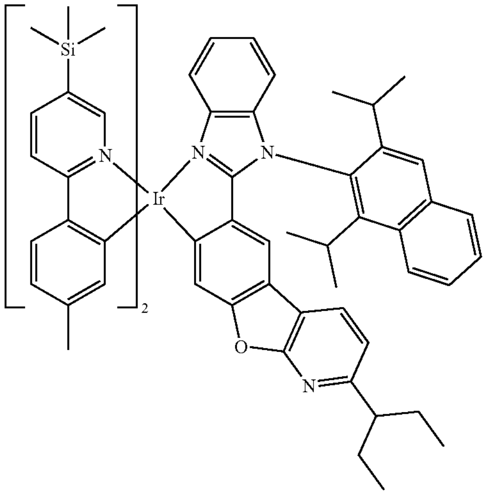
551
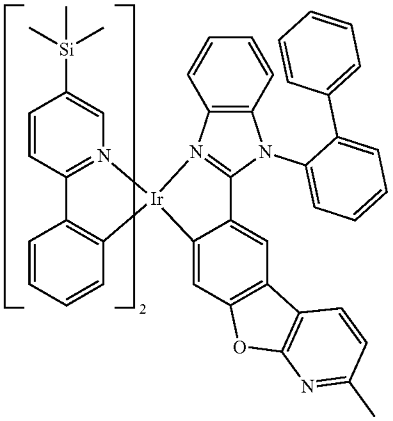
552
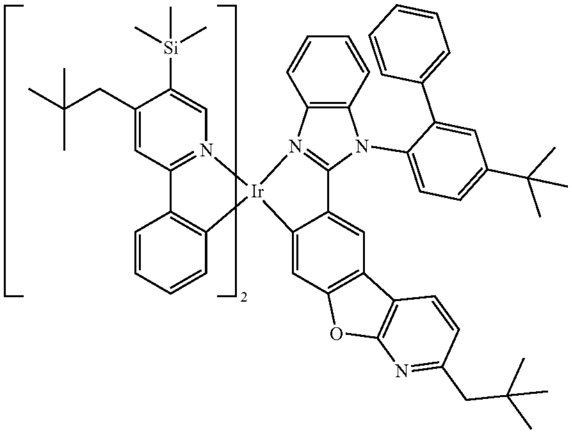
-continued
553
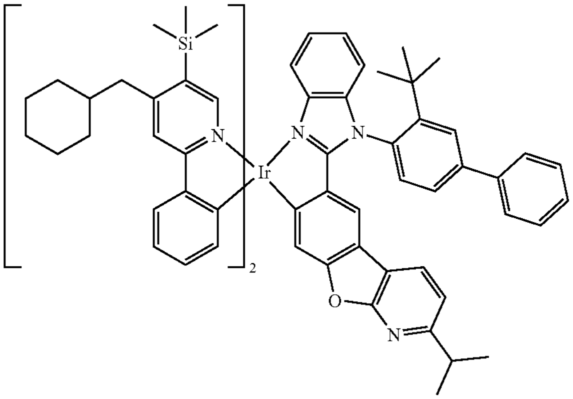
554
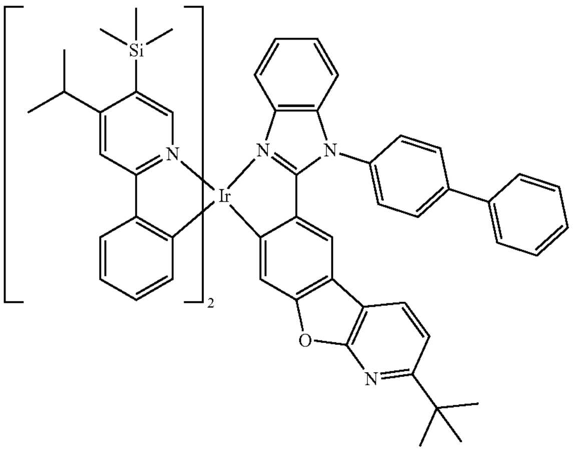
555
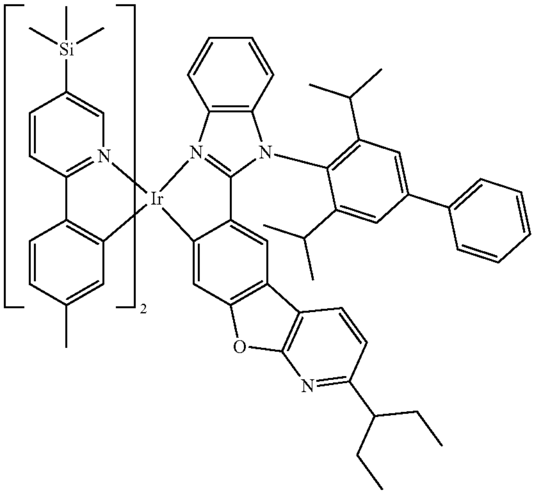

-continued
556
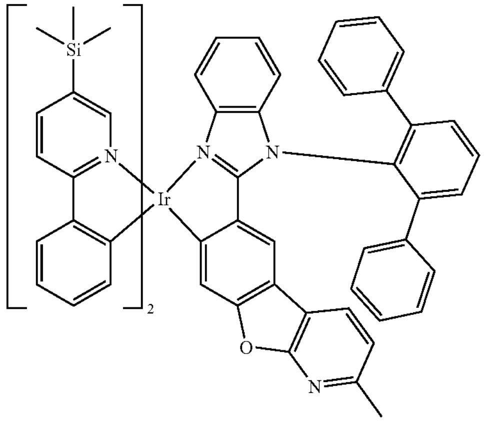
557
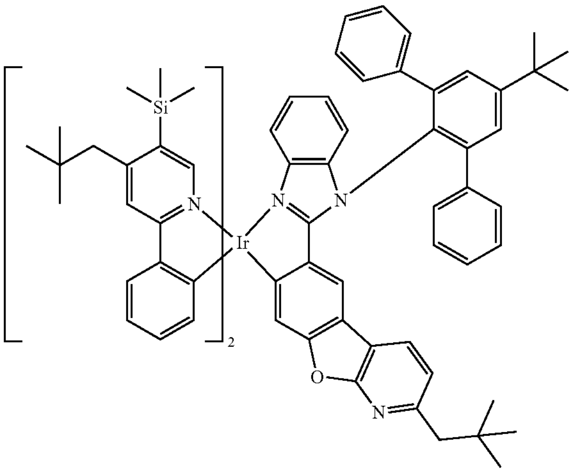
558
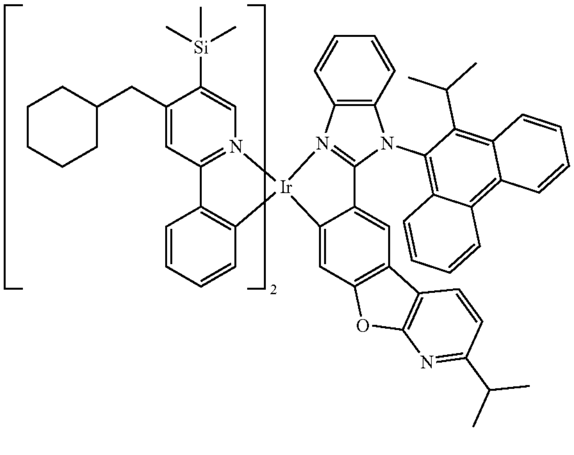
-continued
559
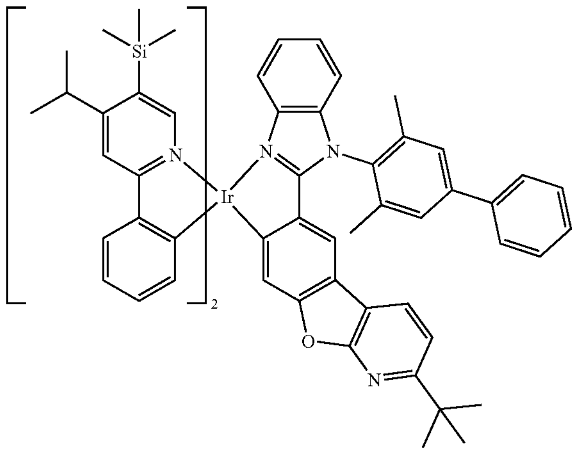
560
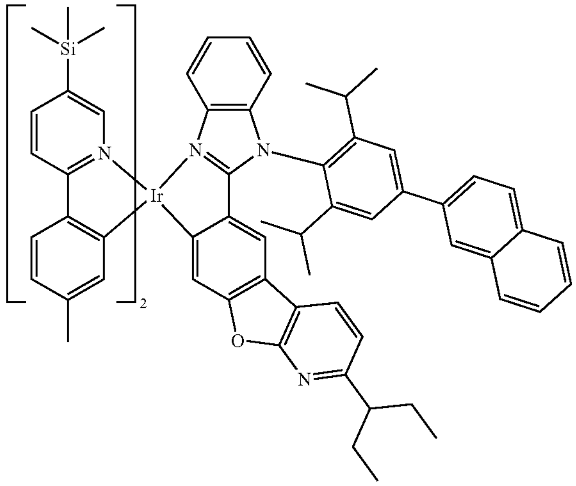
561
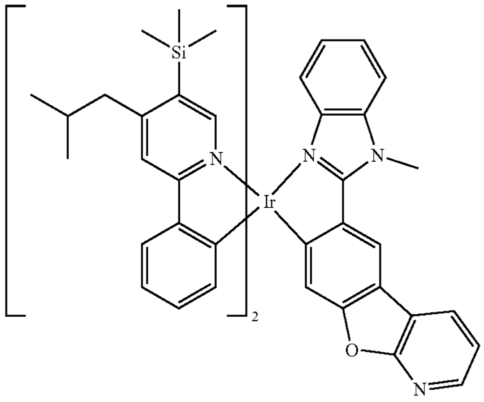

-continued
562
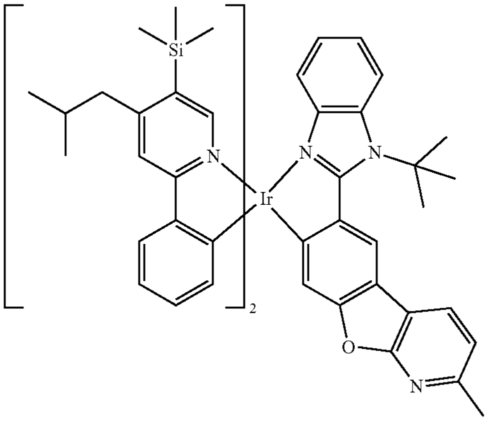
563
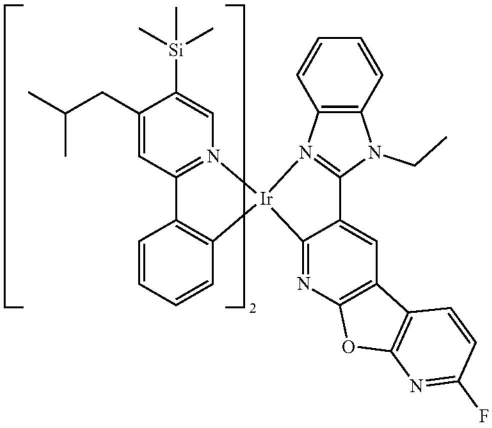
564
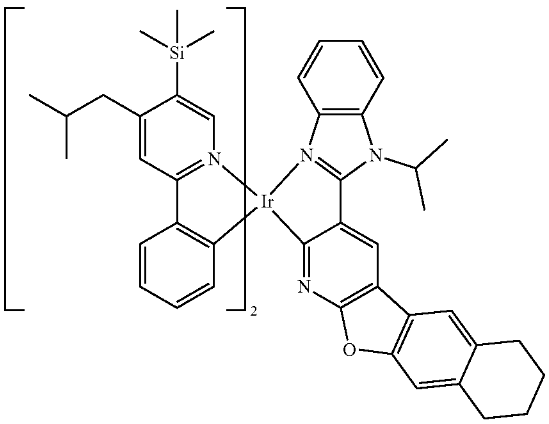
-continued
565
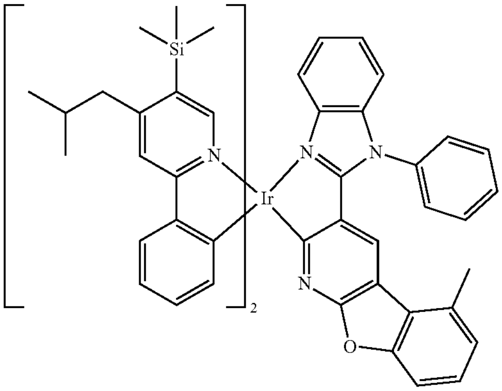
566
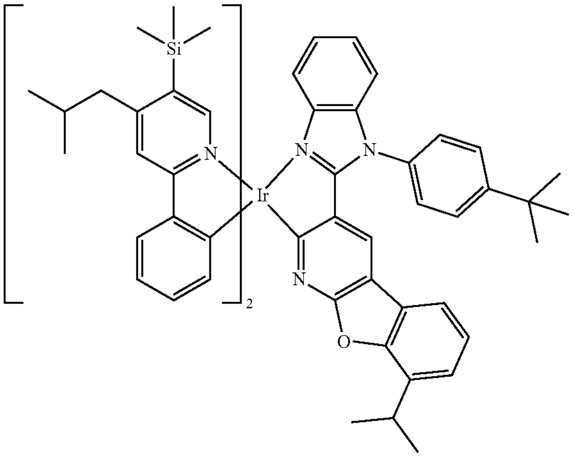
567
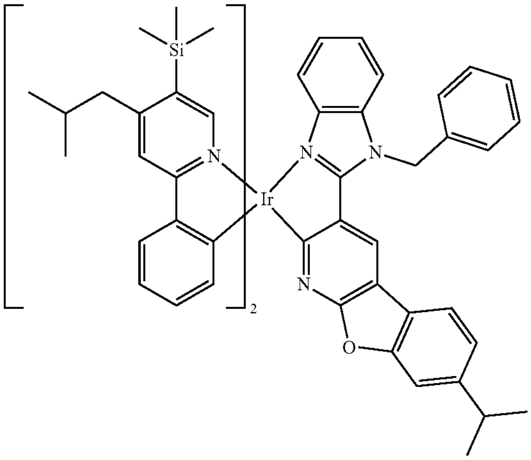

-continued
568
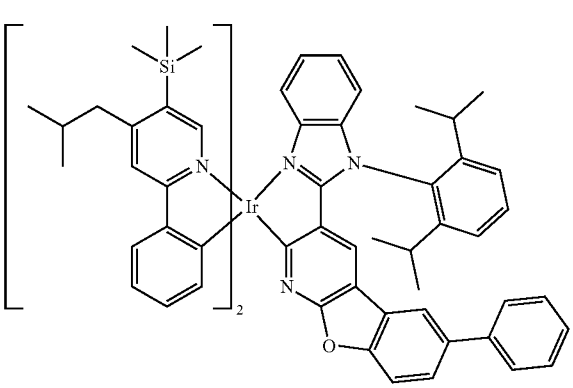
569
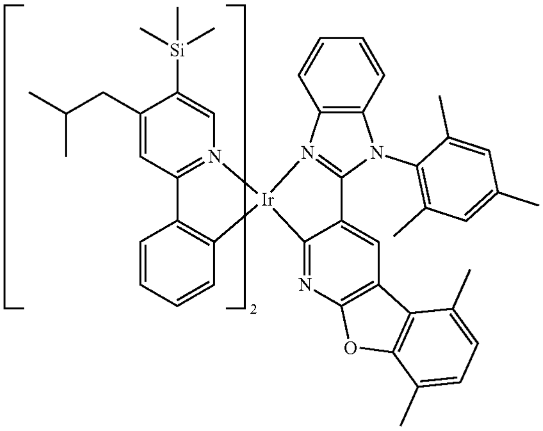
570
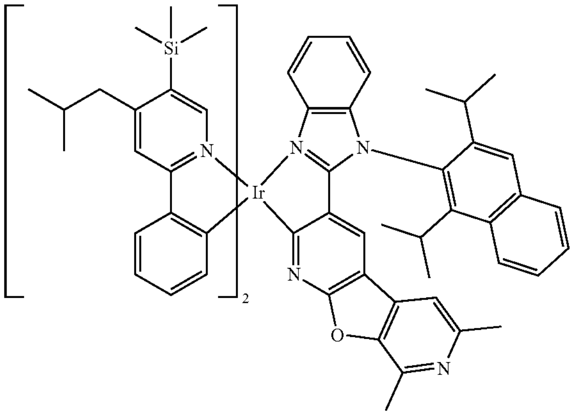
-continued
571
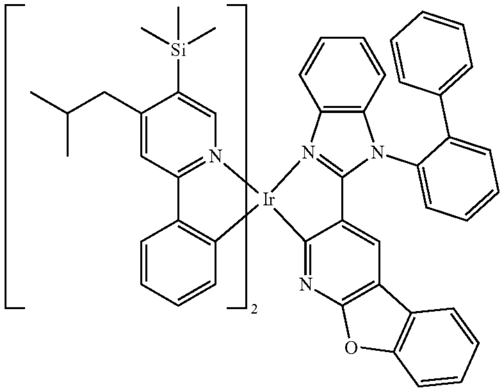
572
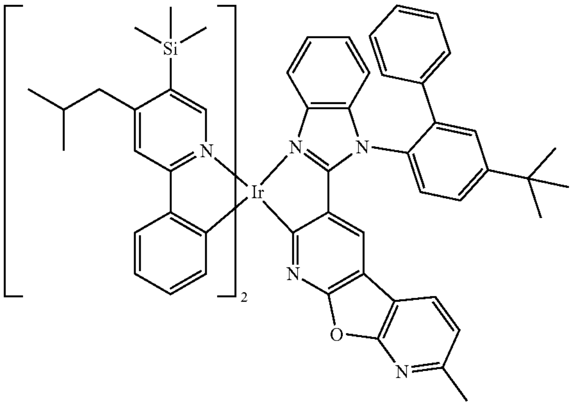
573
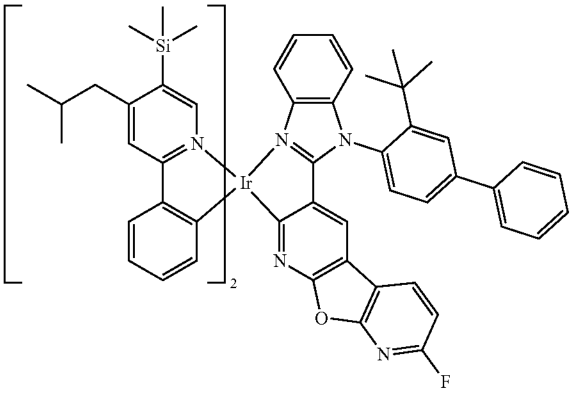
574
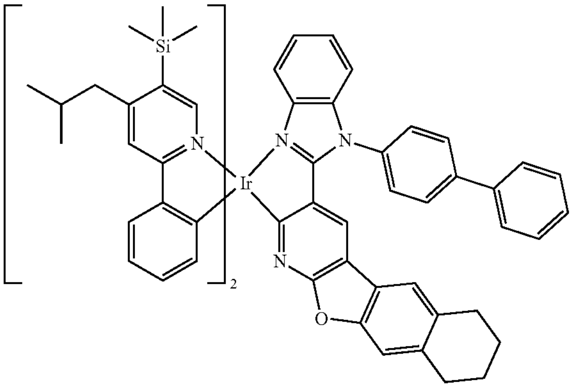

-continued
575
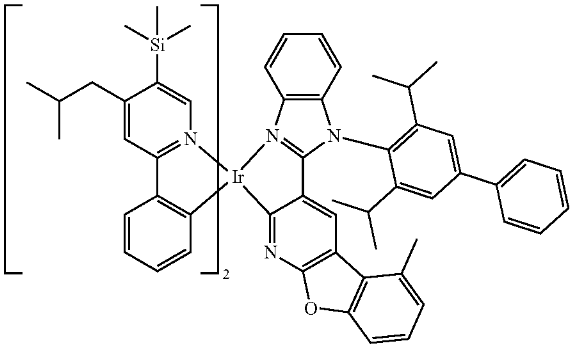
576
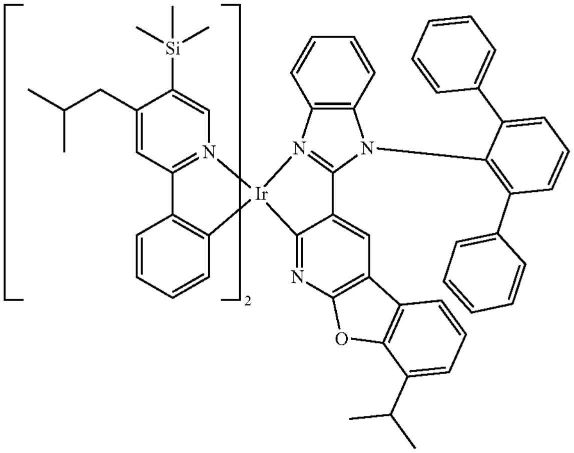
577
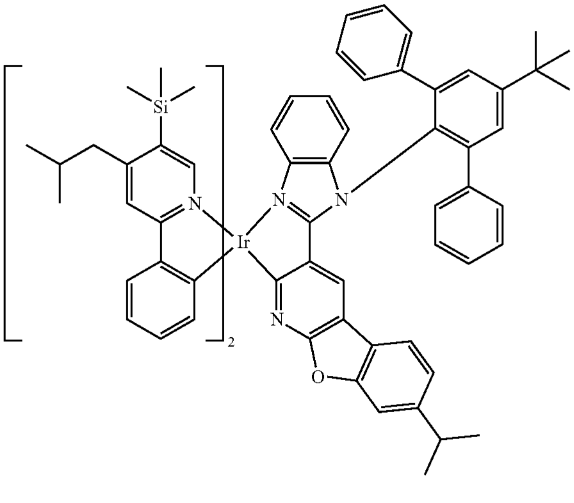
-continued
578
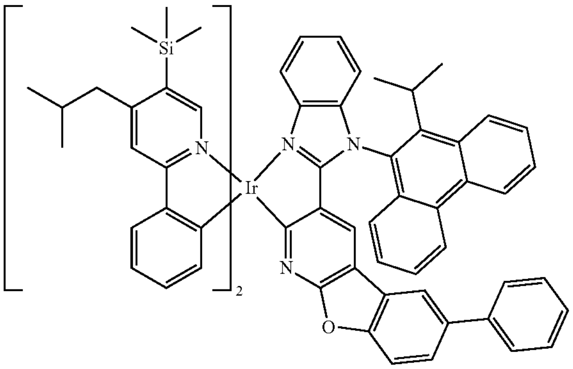
579
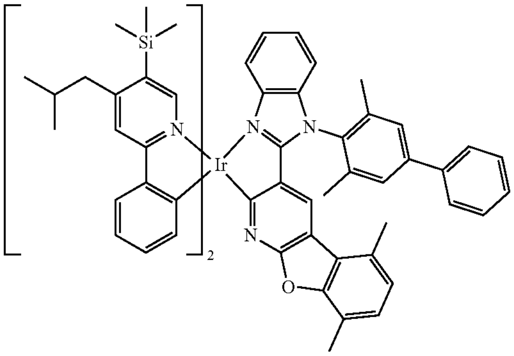
580
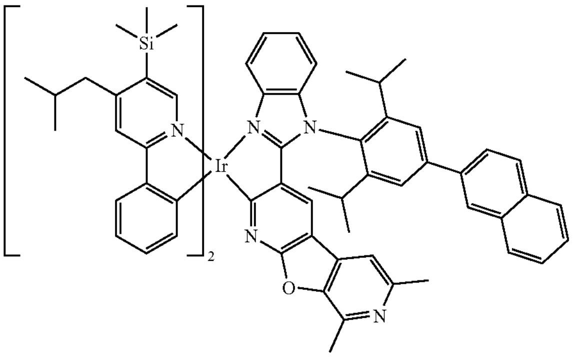
581
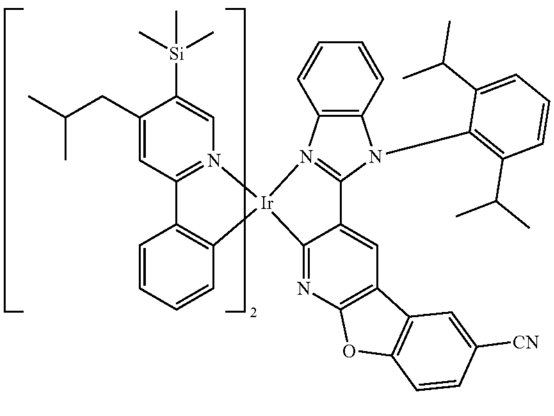

582
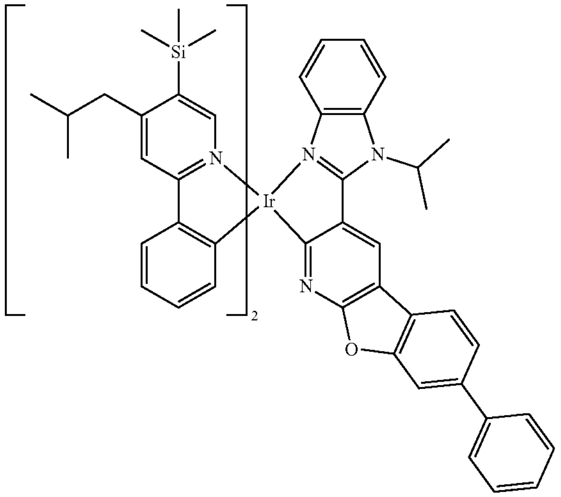
583
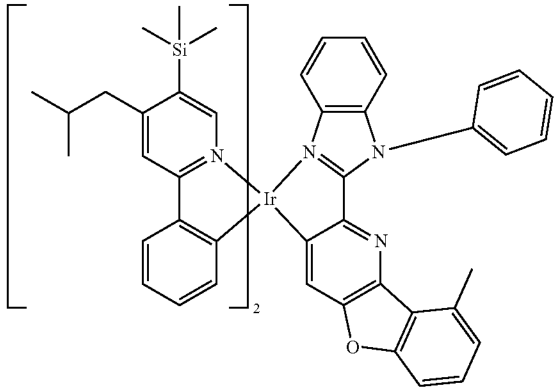
584
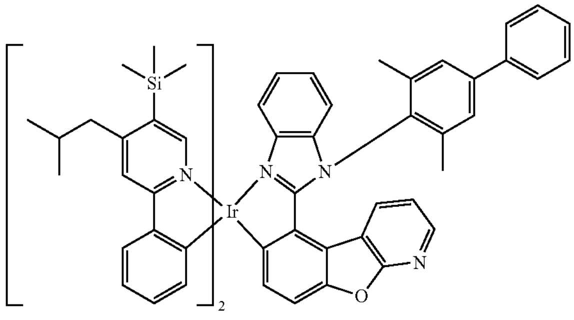
585
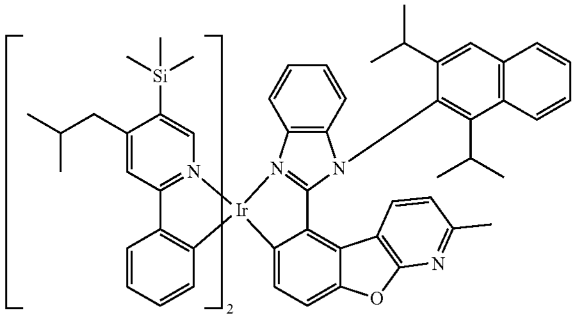
586
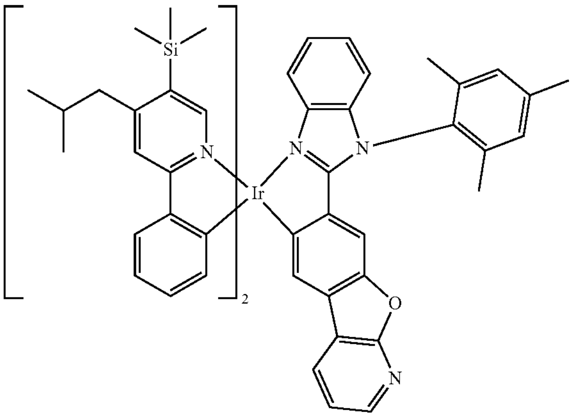
587
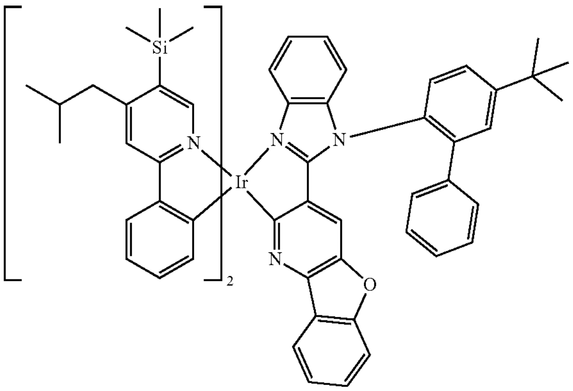
588
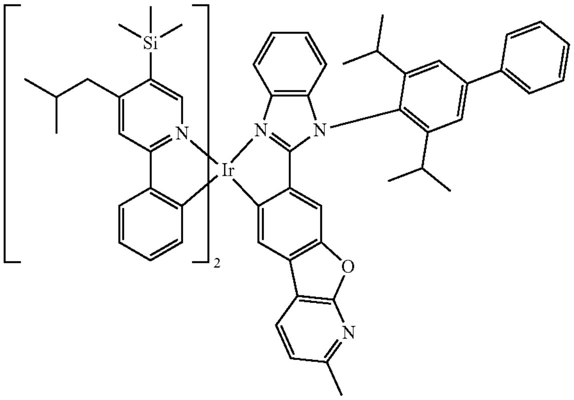

-continued
589
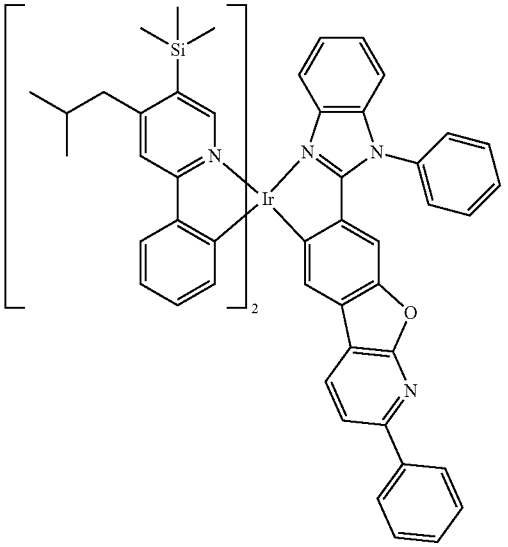
590
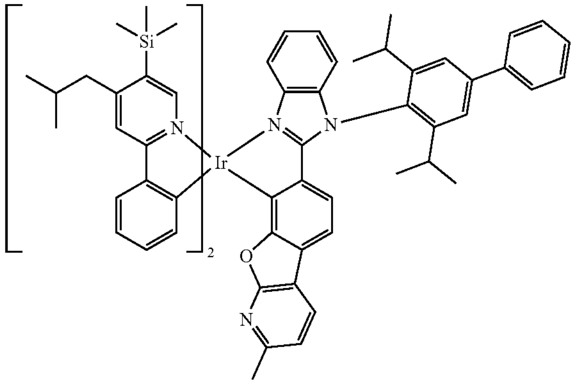
591
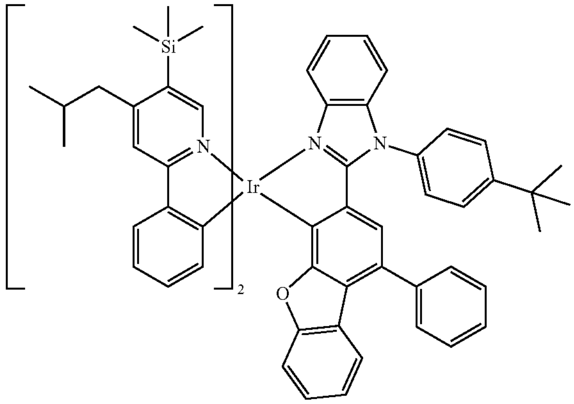
-continued
592
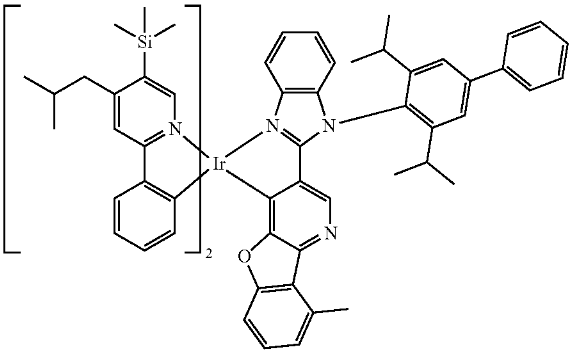
593
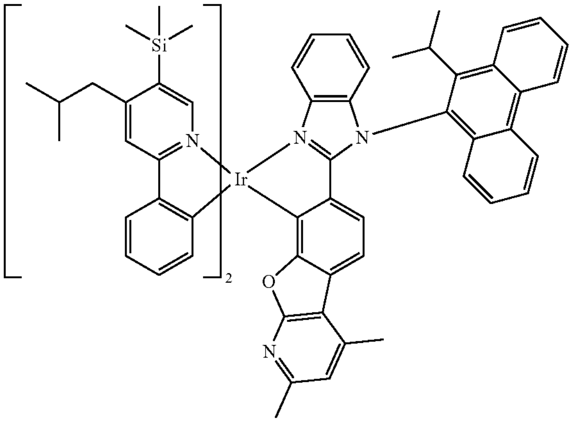
594
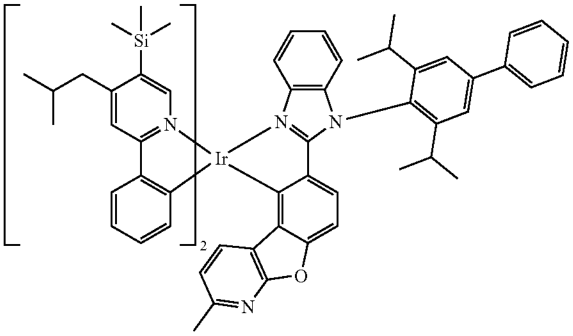
595
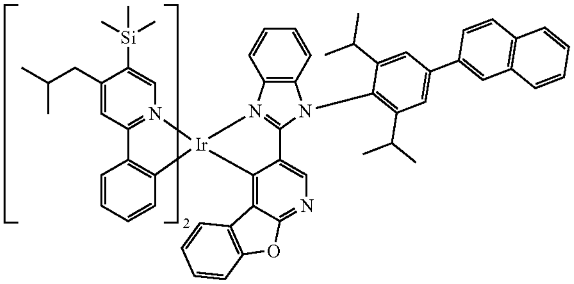

-continued
596
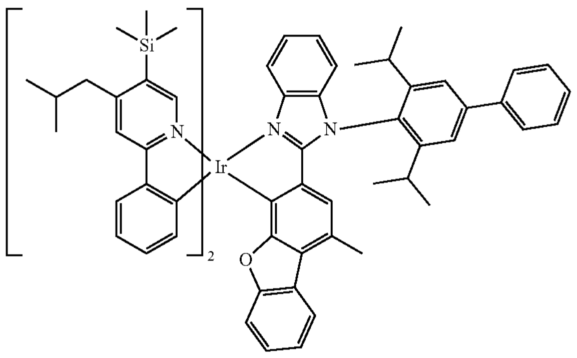
597
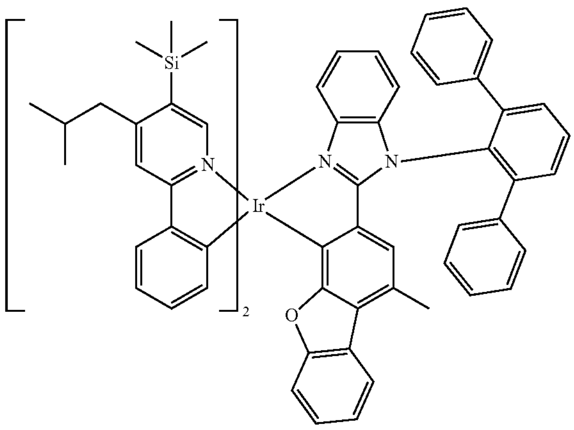
598
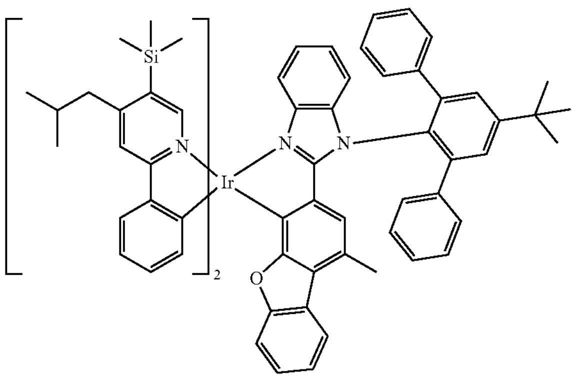
599
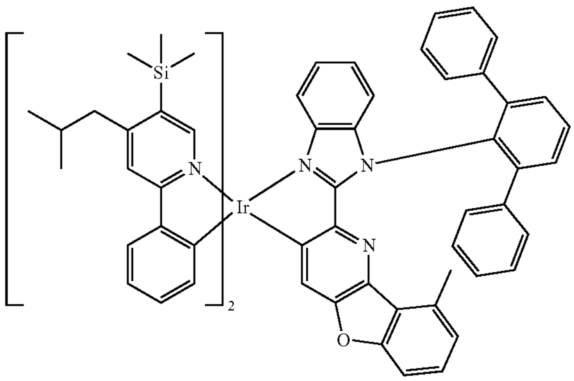
-continued
600
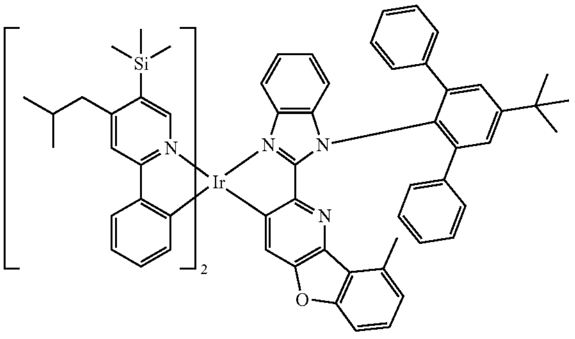
601
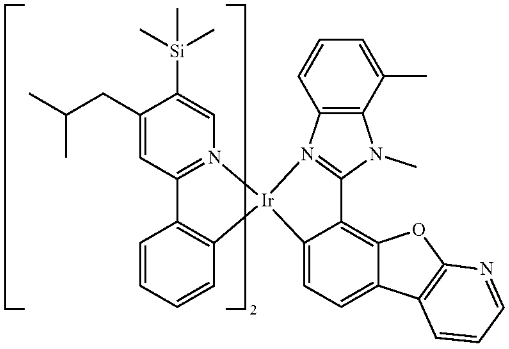
602
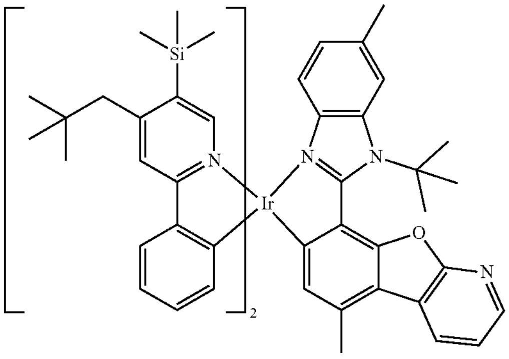
603
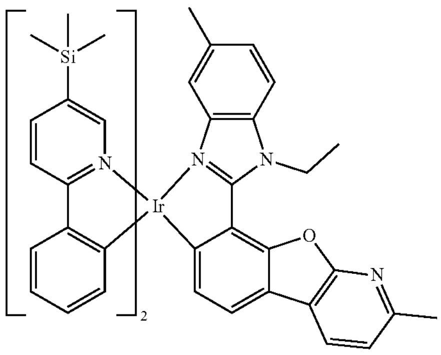

-continued
604
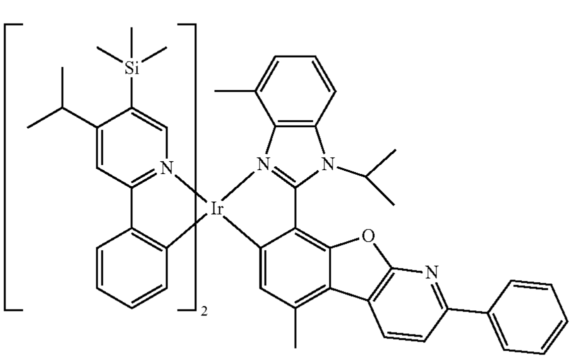
605
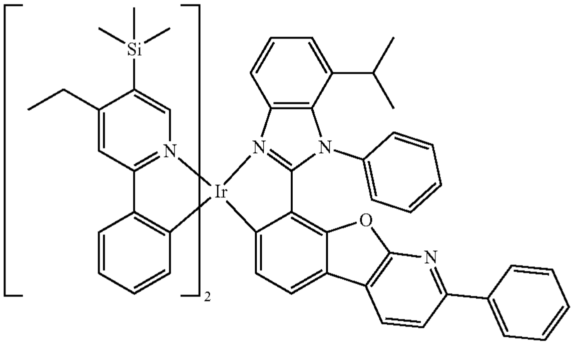
606
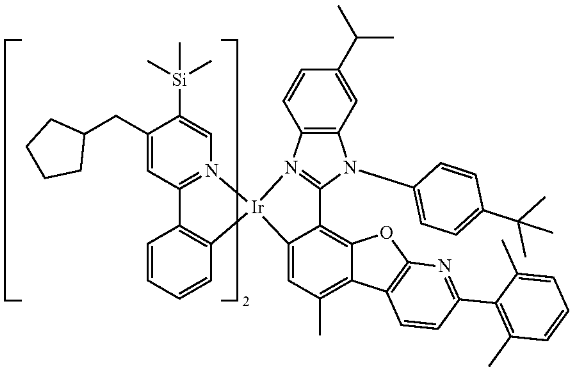
607
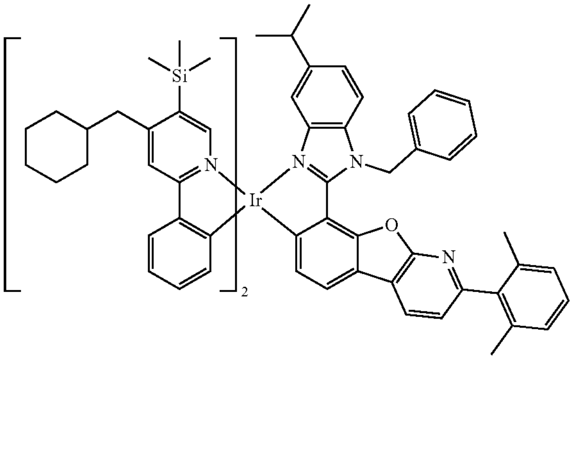
-continued
608
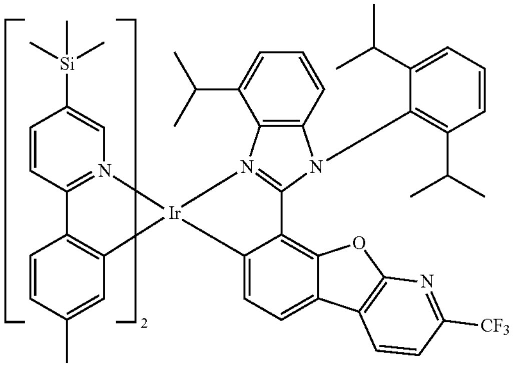
609
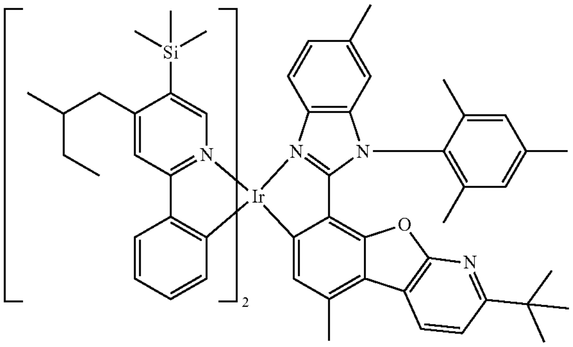
610
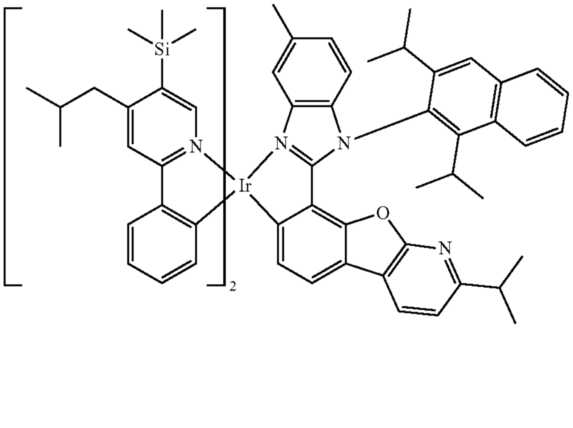

-continued
611
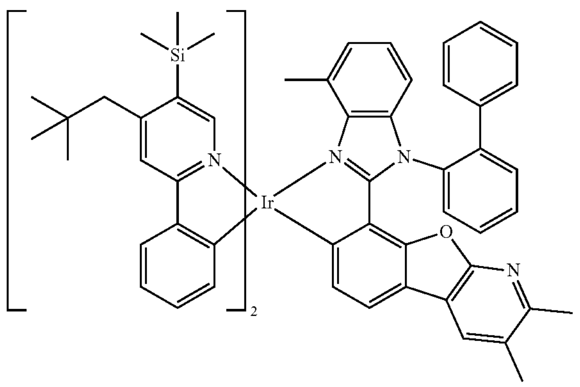
-continued
612
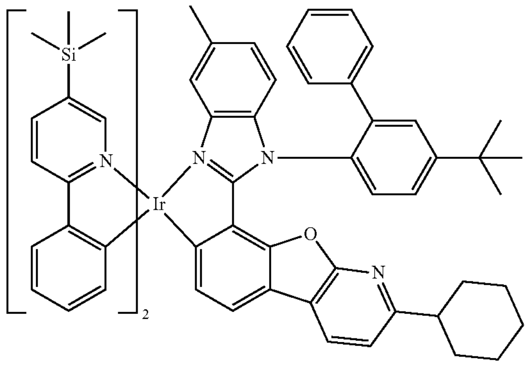
613
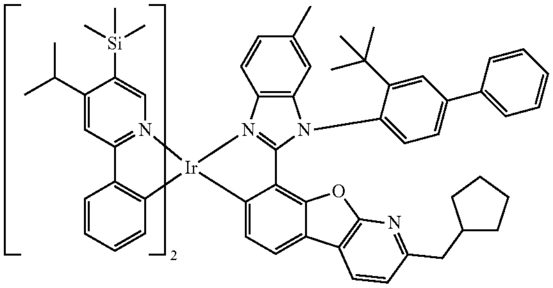
614
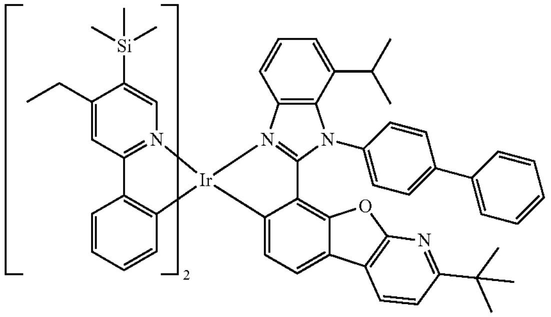
615
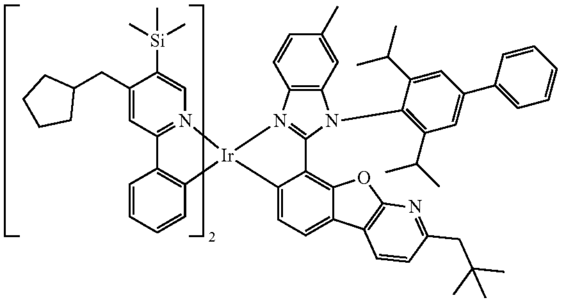
616
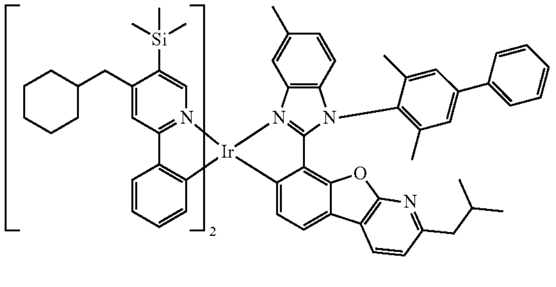
617
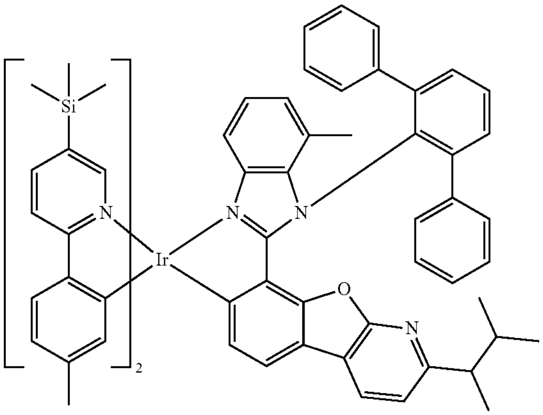
618
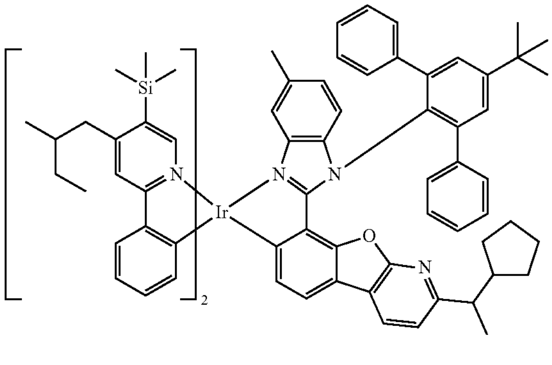

-continued
619
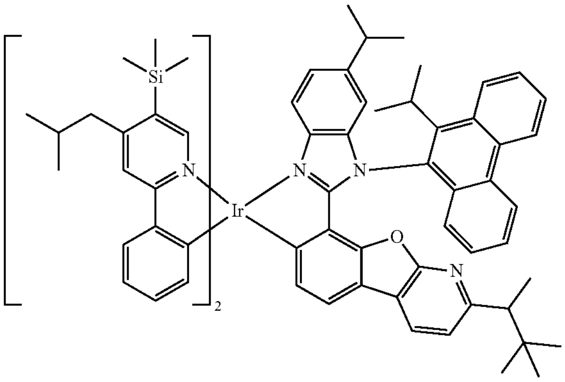
620
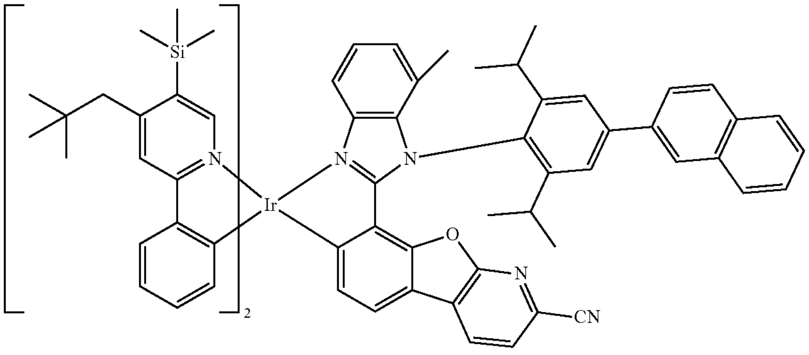
621
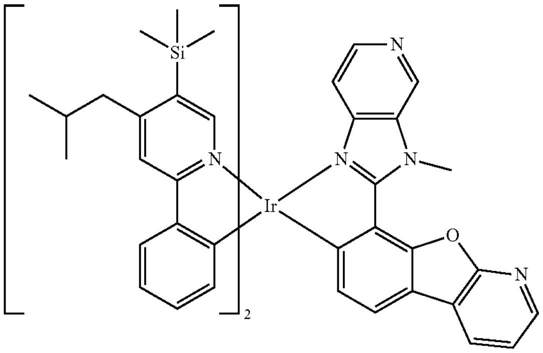
622
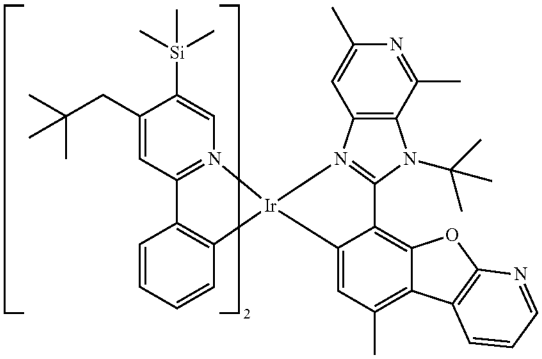
623
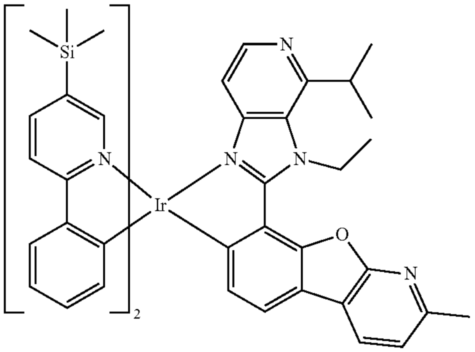
624
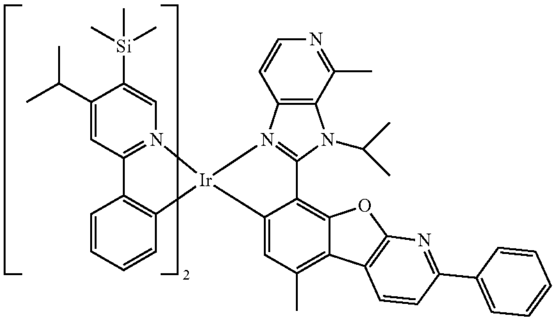

-continued
625
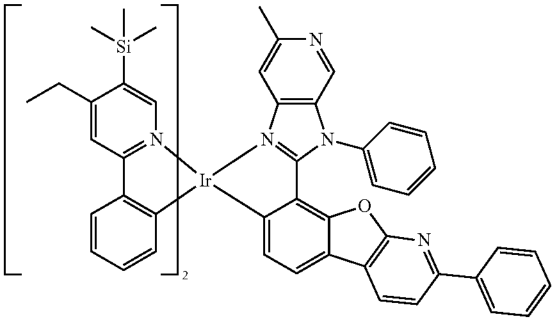
626
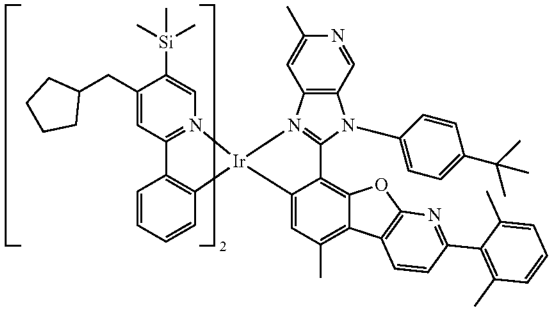
627
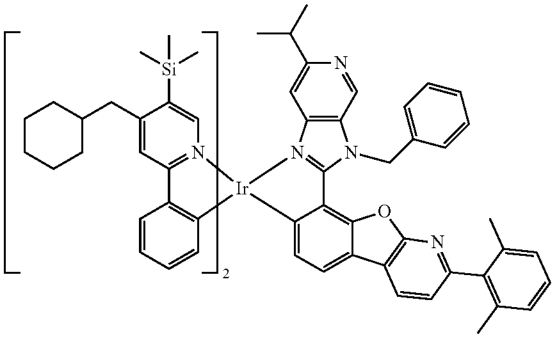
628
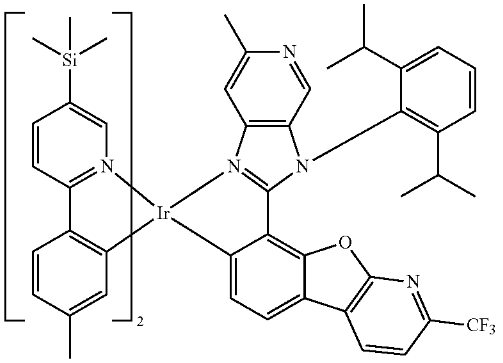
629
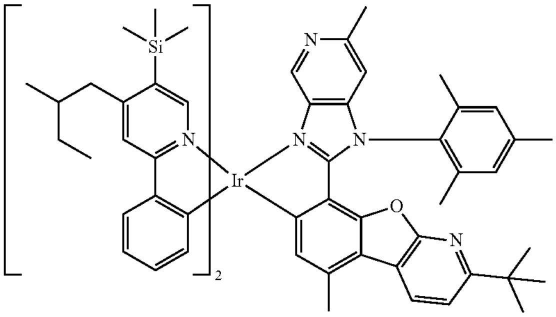
630
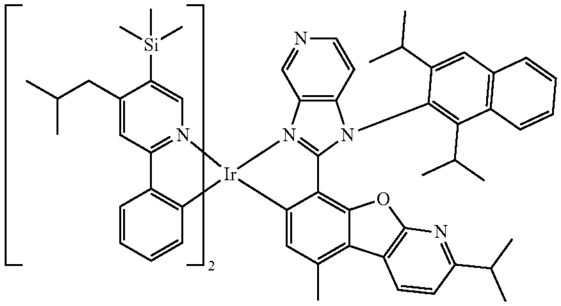
631
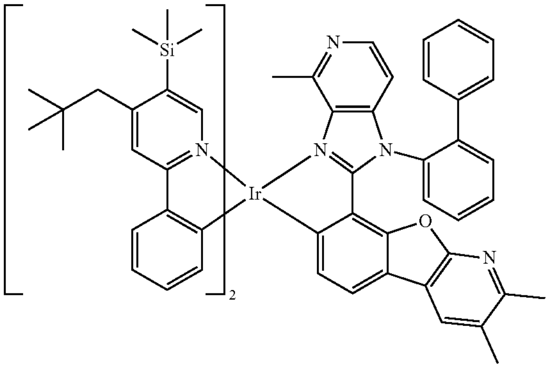
632
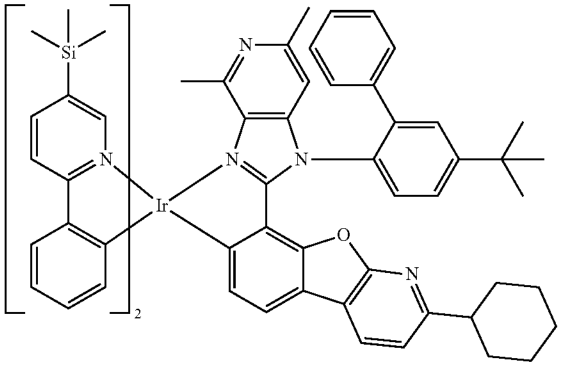

-continued
633
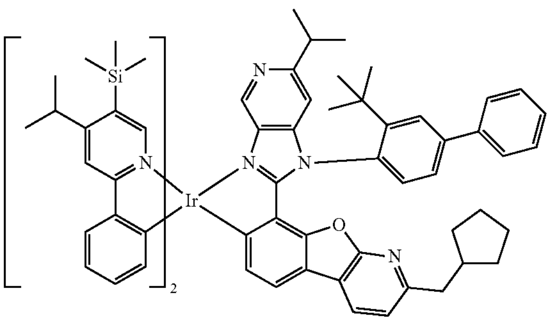
634
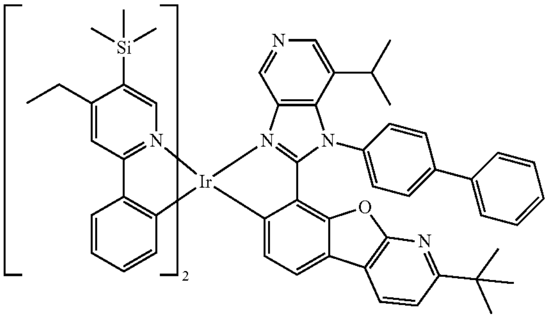
635
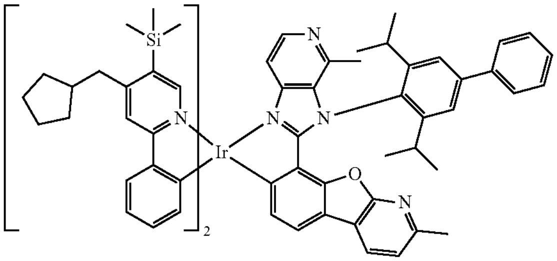
636
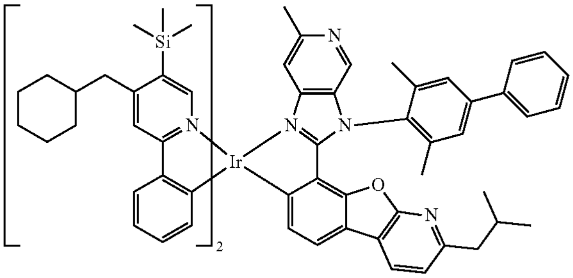
637
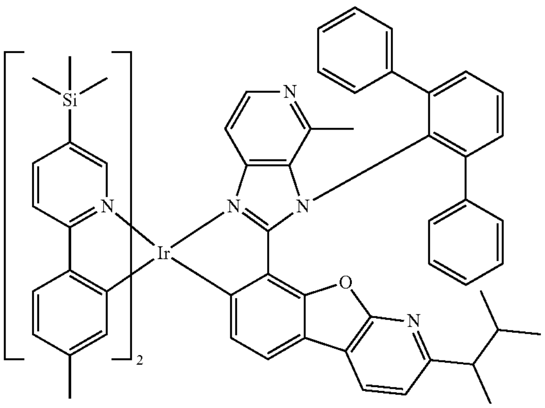
638
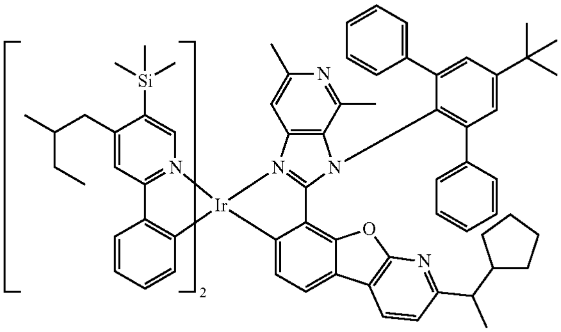
639
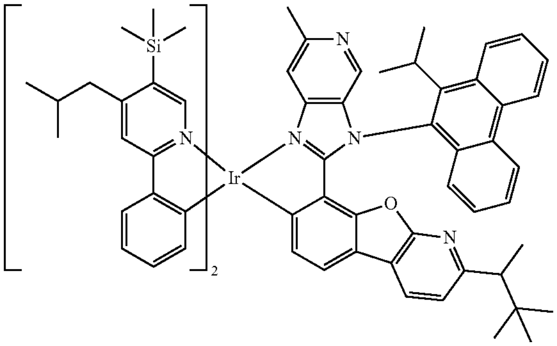

-continued
640
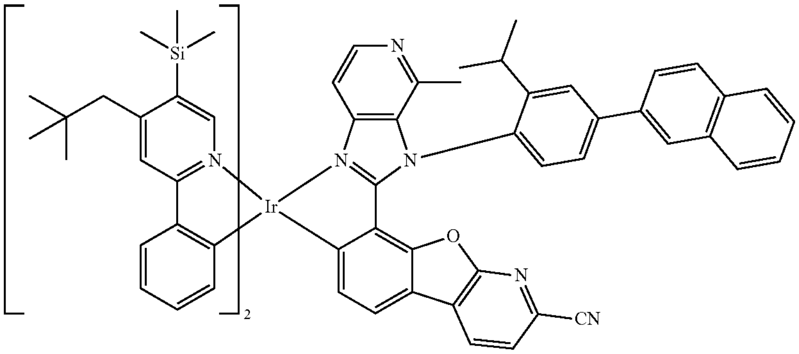
641
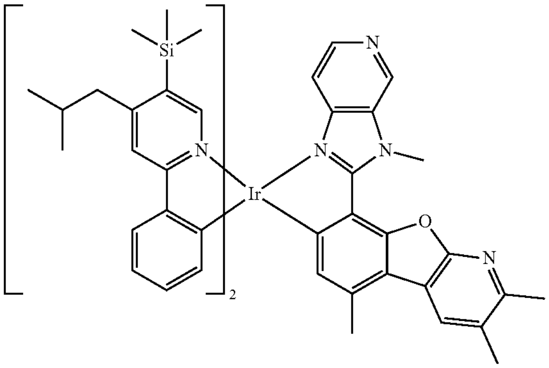
642
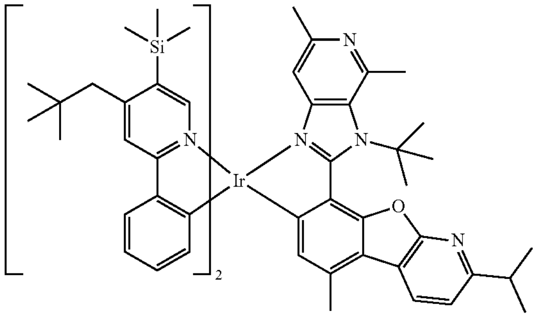
643
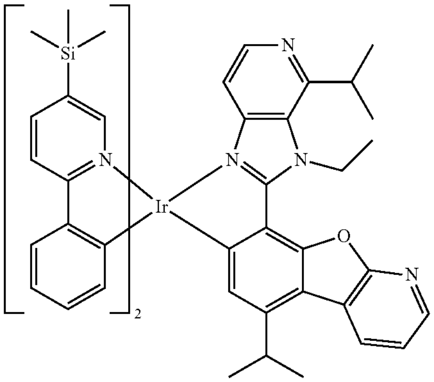
644
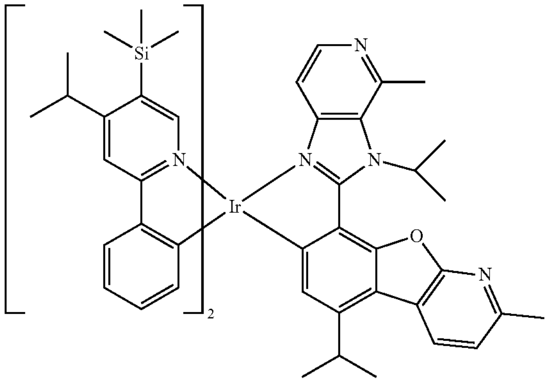
645
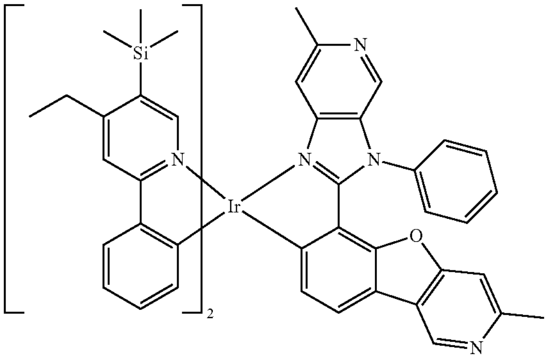
646
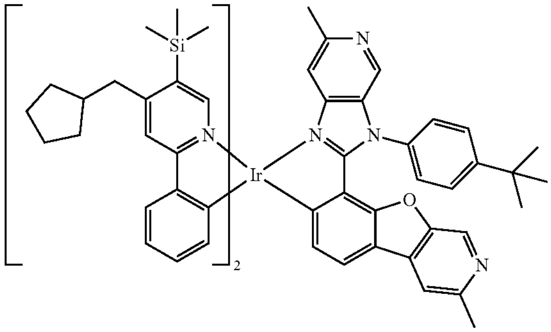

-continued
647
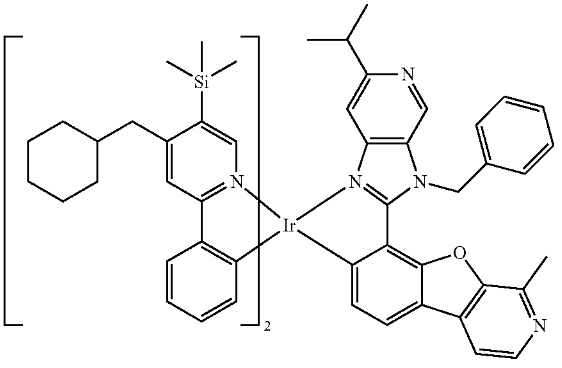
648
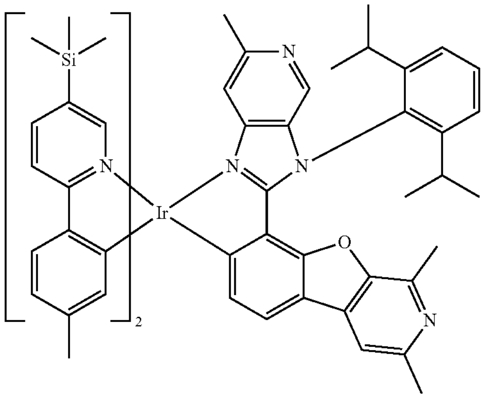
649
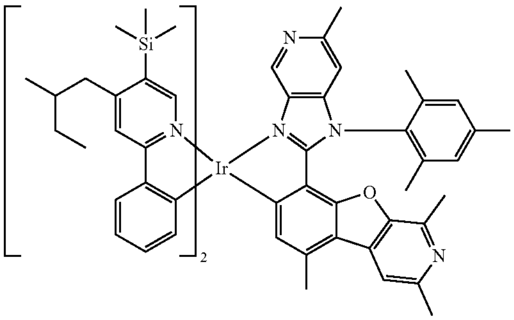
650
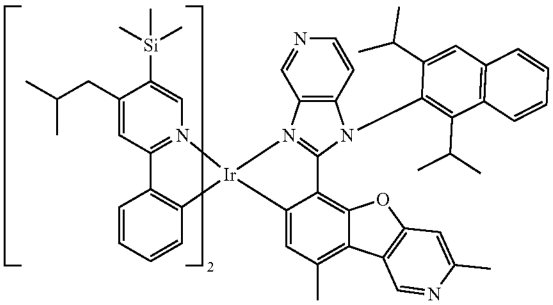
651
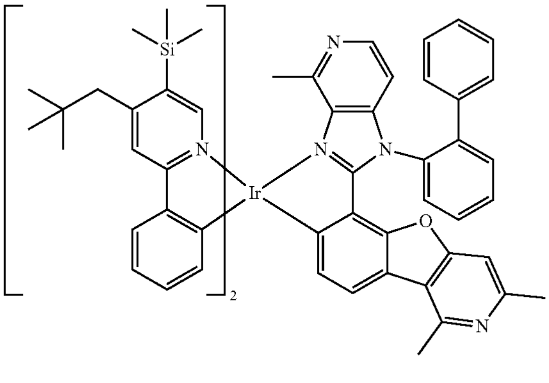
652
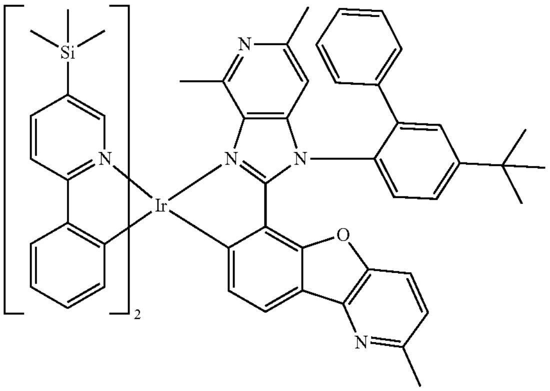
653
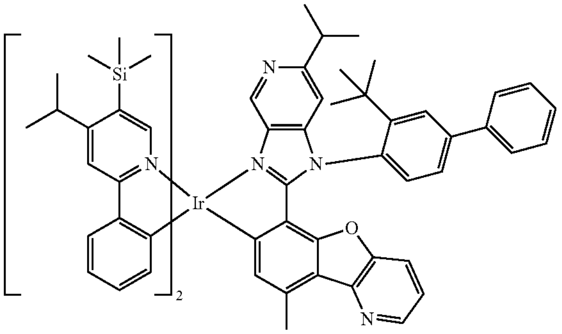
654
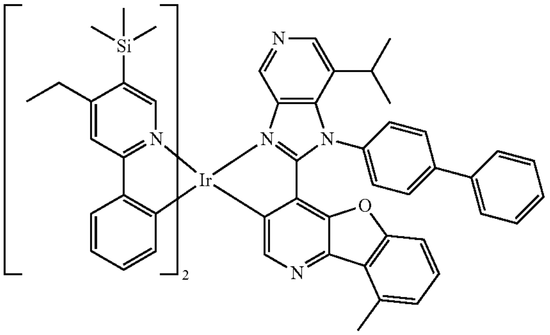

-continued
655
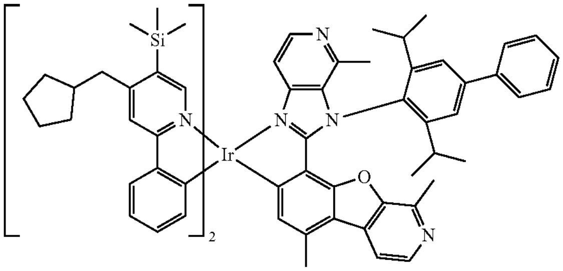
656
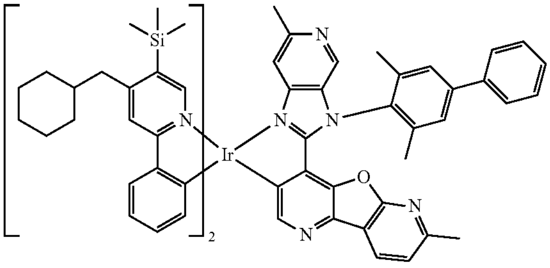
657
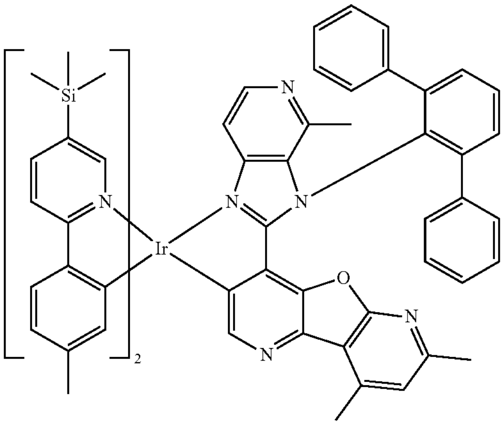
658
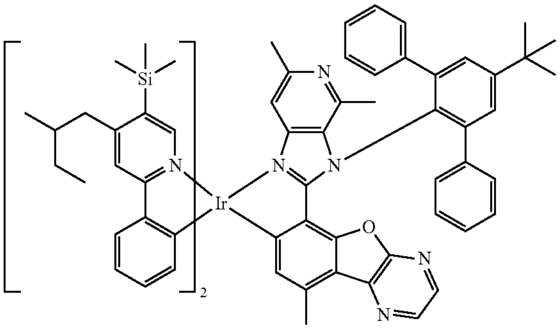
659
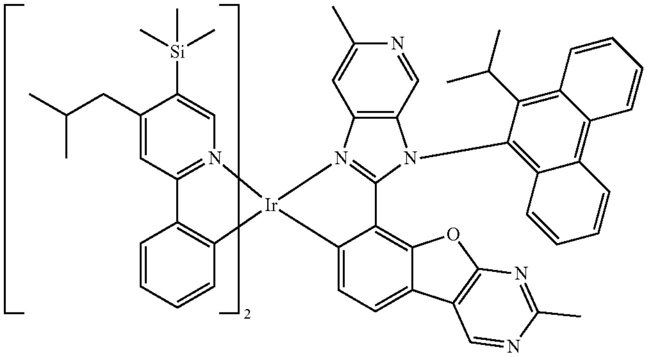
660
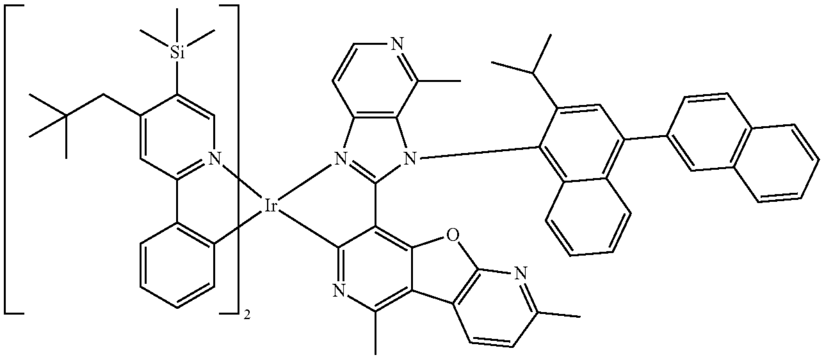

-continued
661
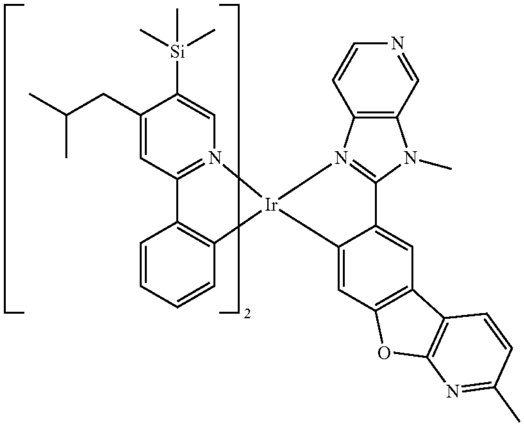
662
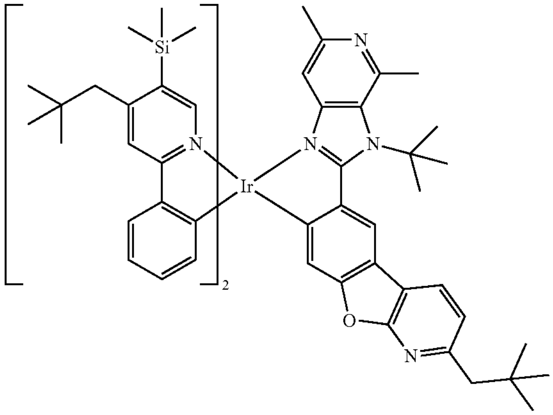
663
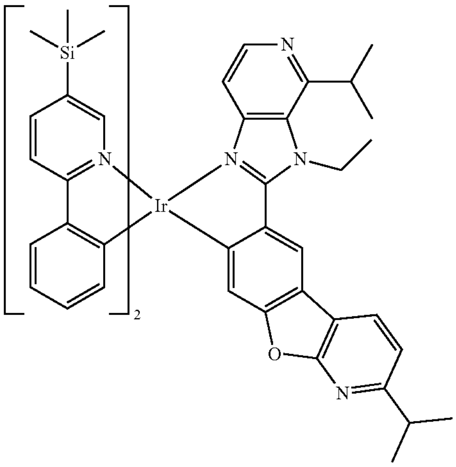
664
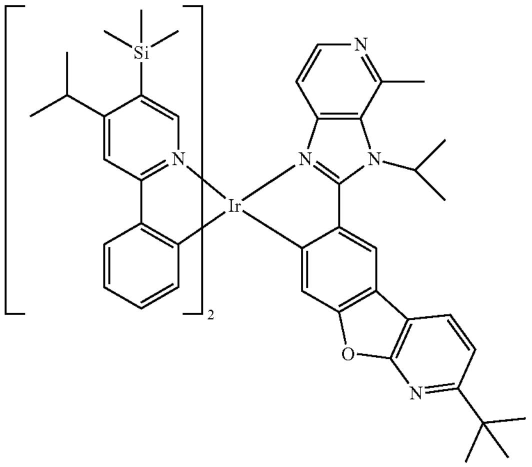
665
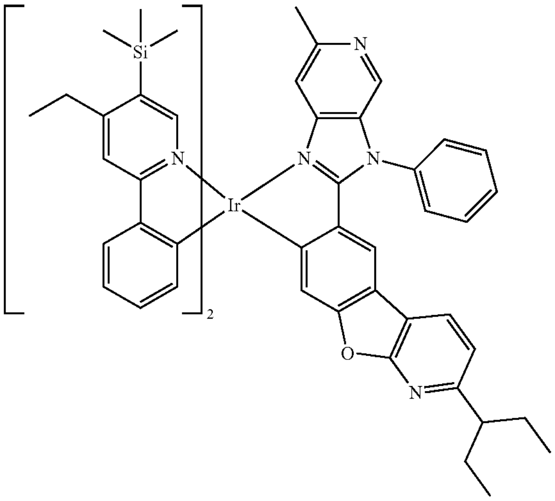
666
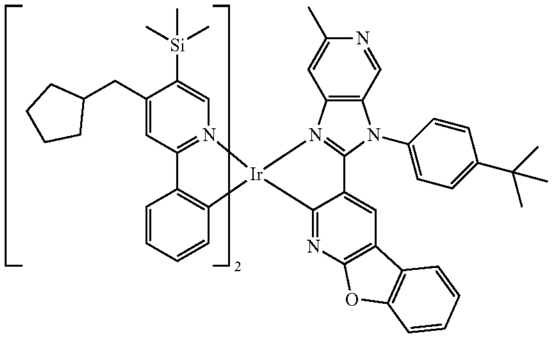

-continued
667
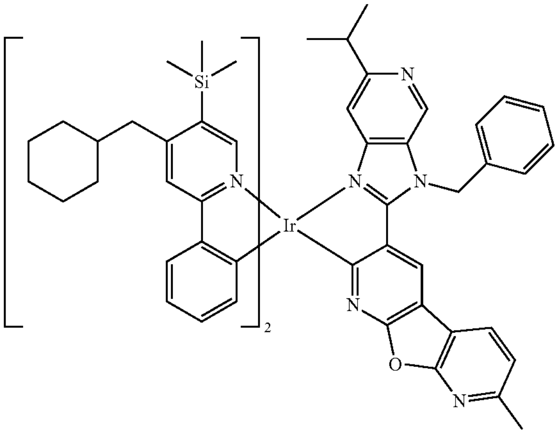
668
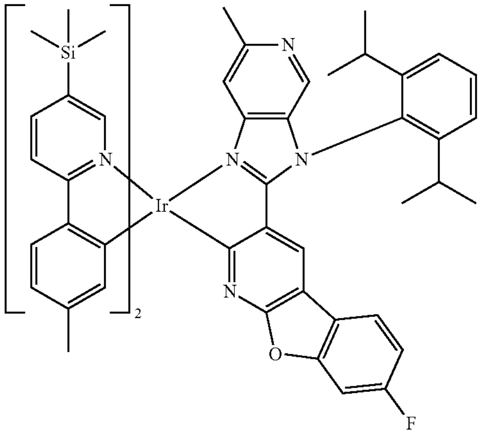
669
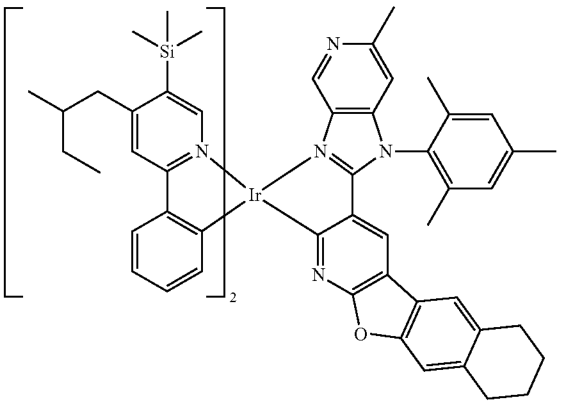
670
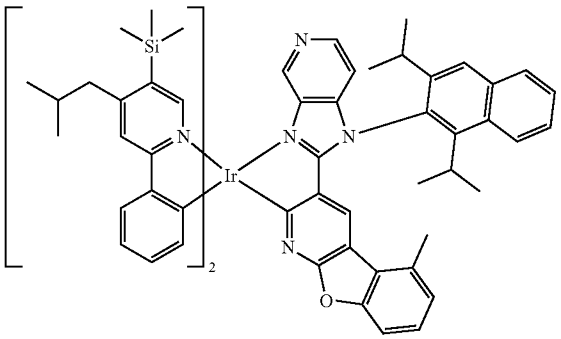
671
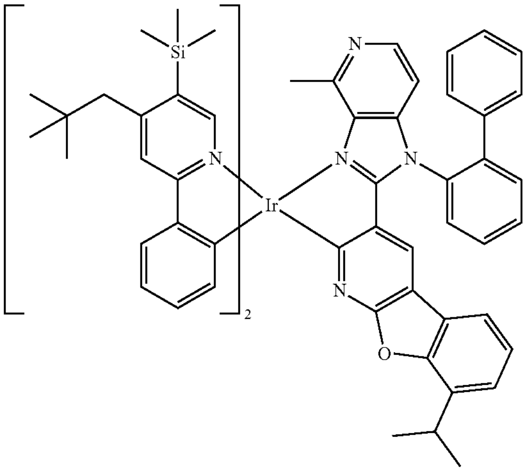
672
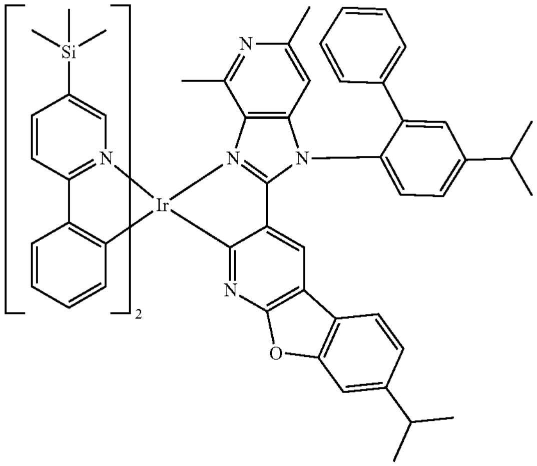

-continued
673
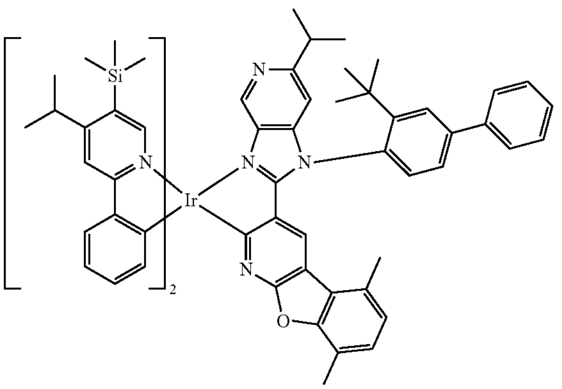
674
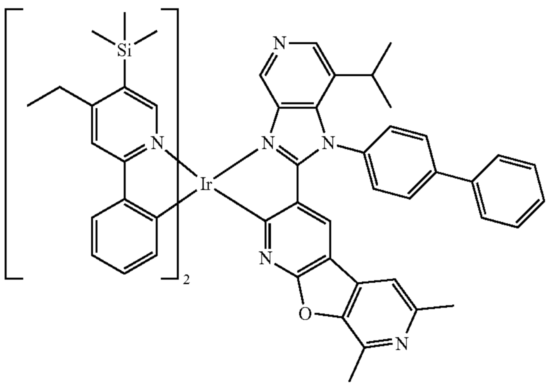
675
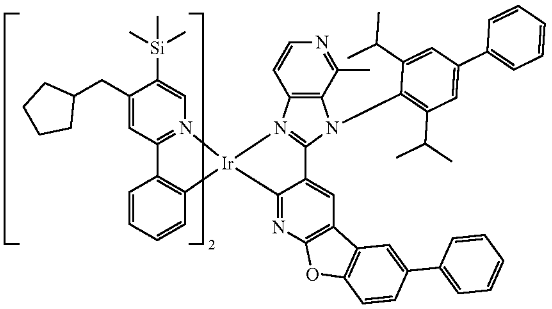
676
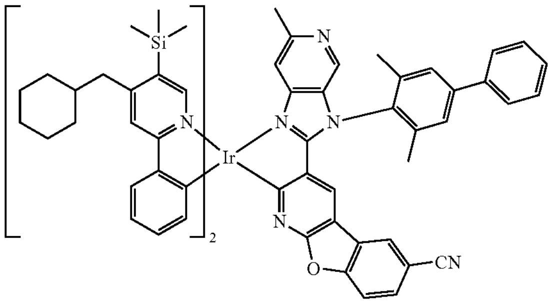
677
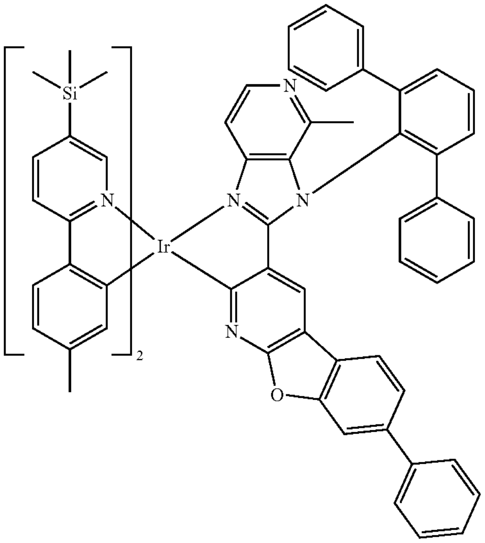
678
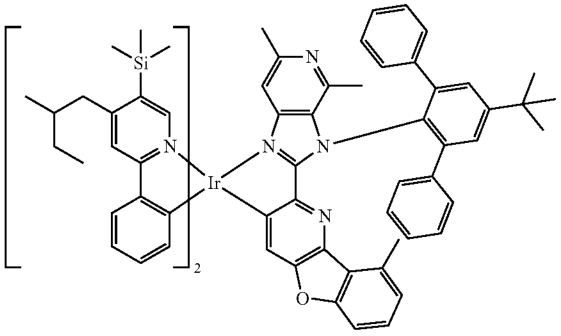
679
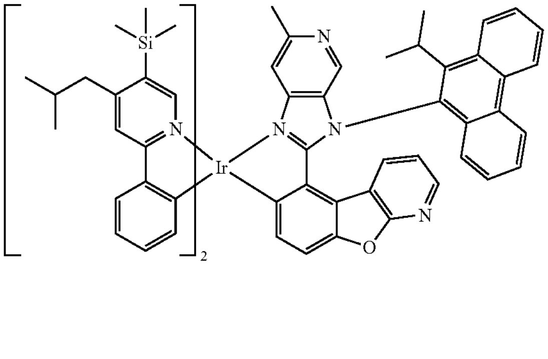

-continued
680
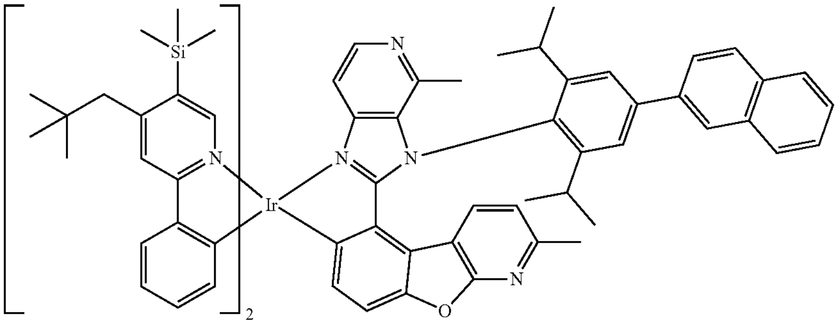
681
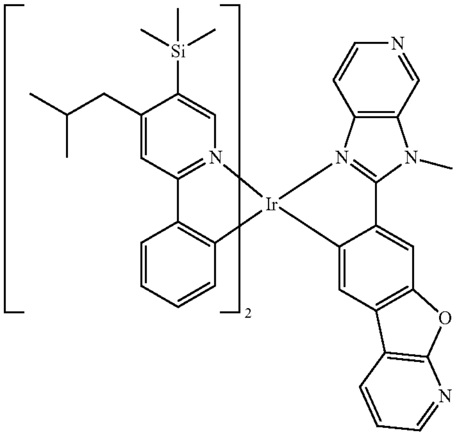
682
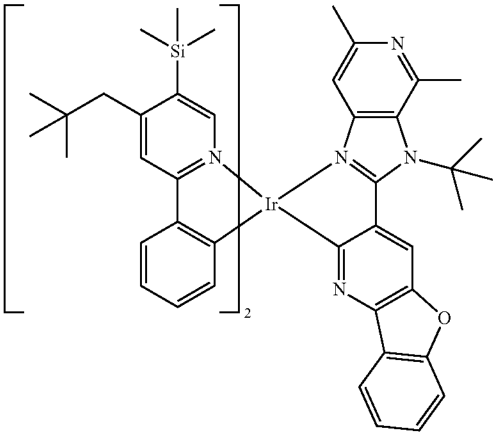
683
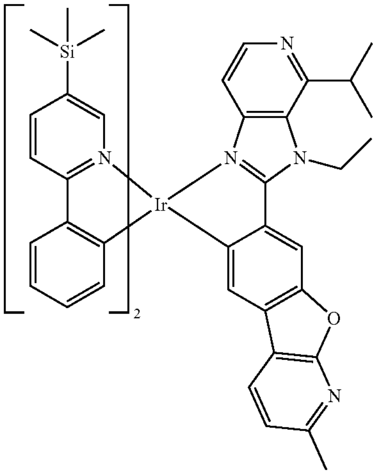
684
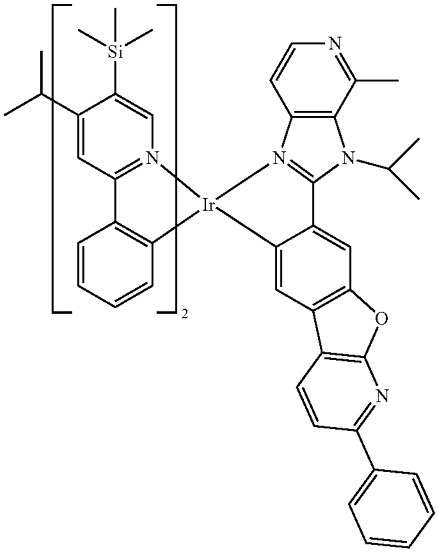

-continued
685
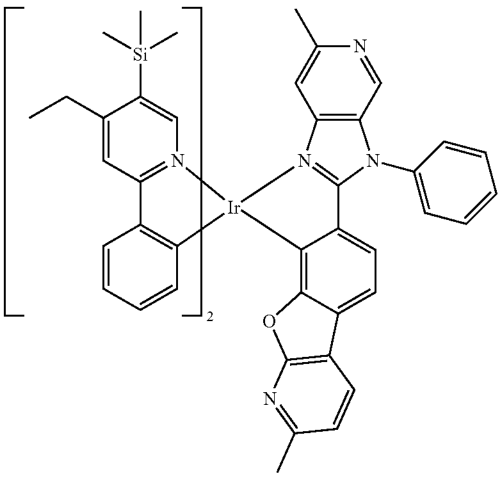
686
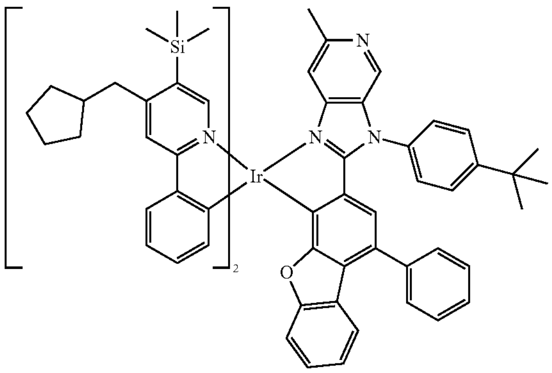
687
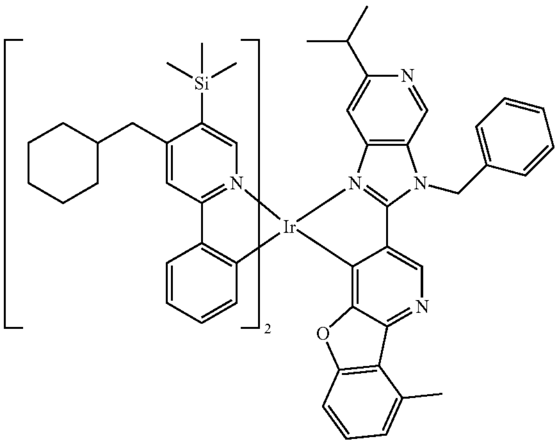
688
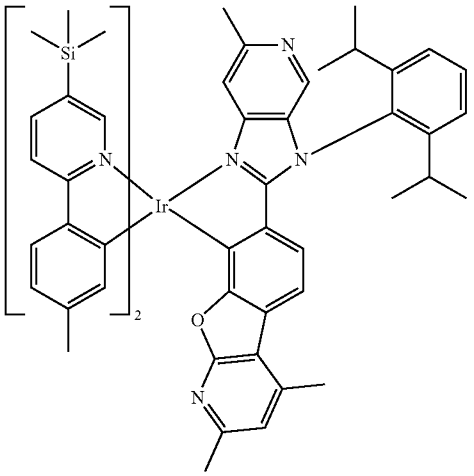
689
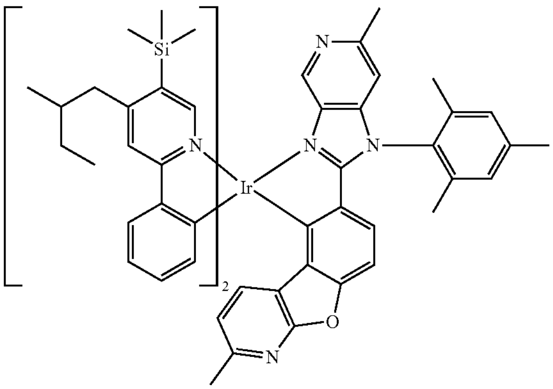
690
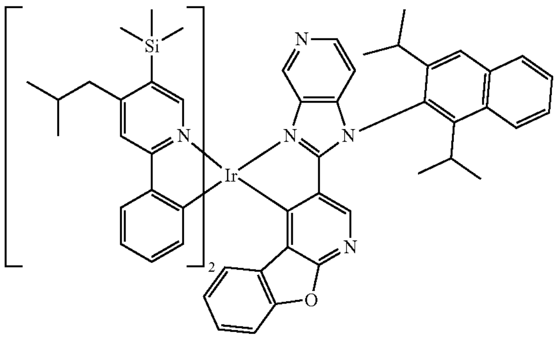

-continued
691
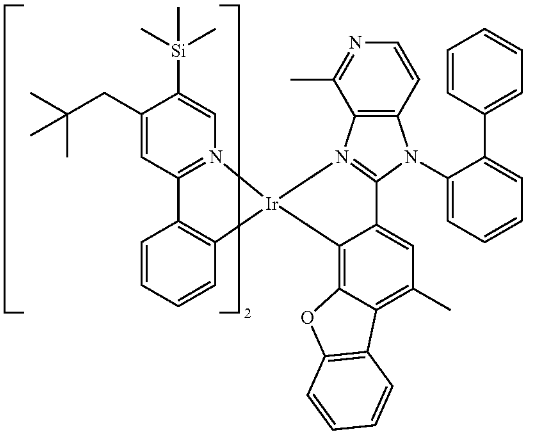
692
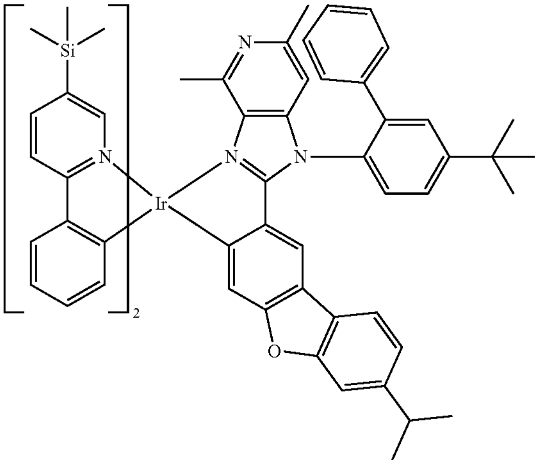
693
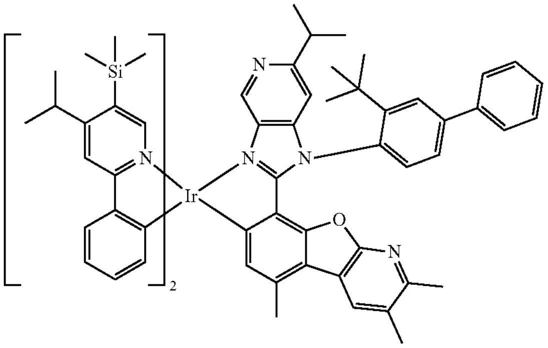
694
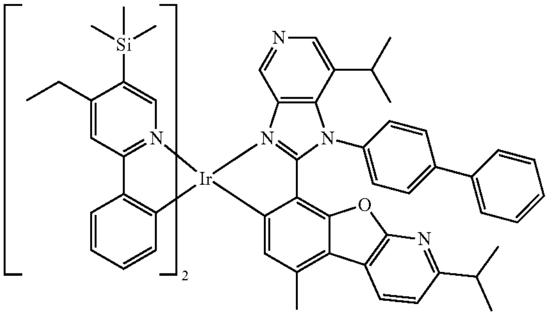
695
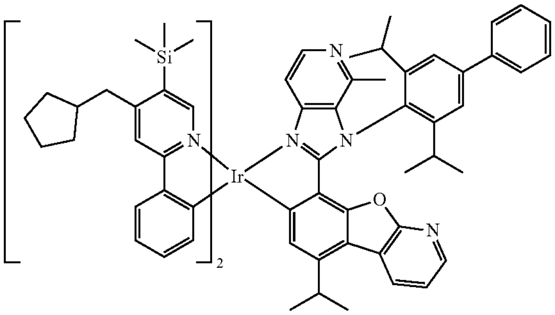
696
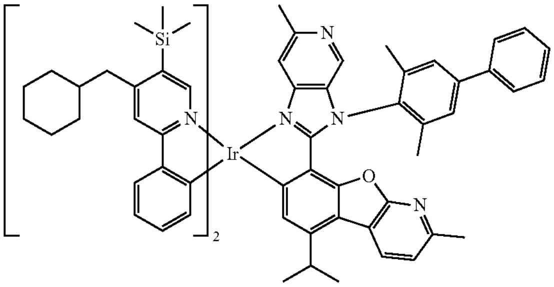
697
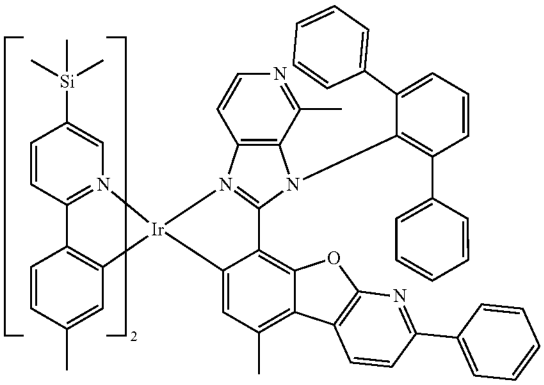
698
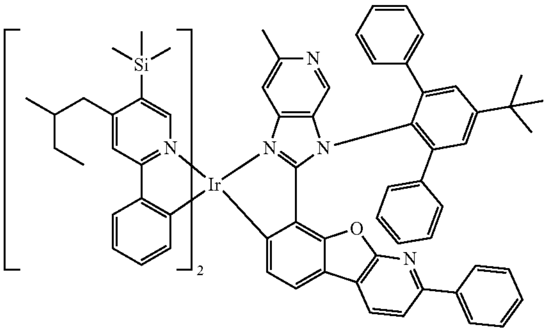

-continued
699
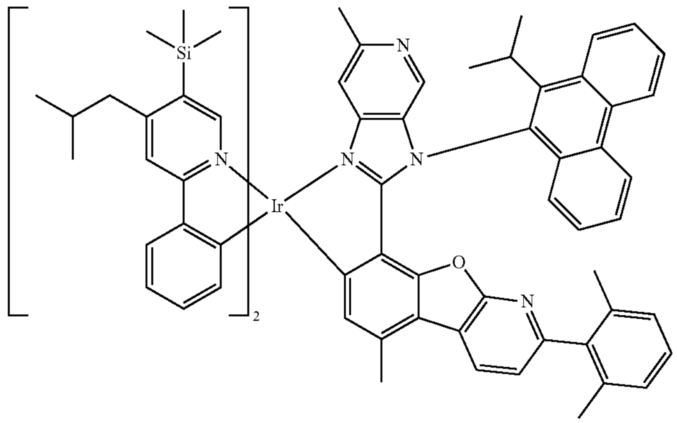
700
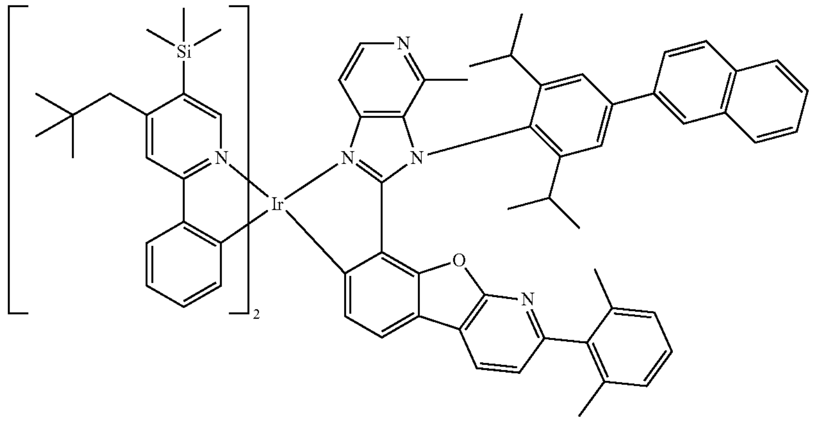
701
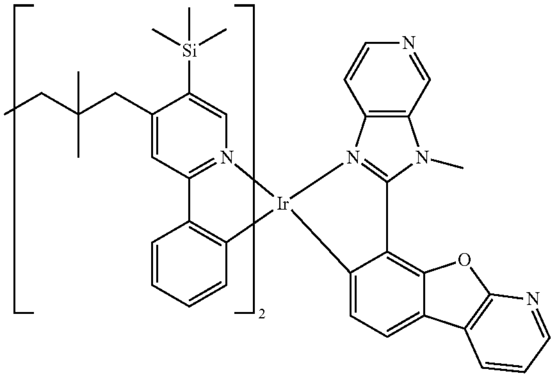
702
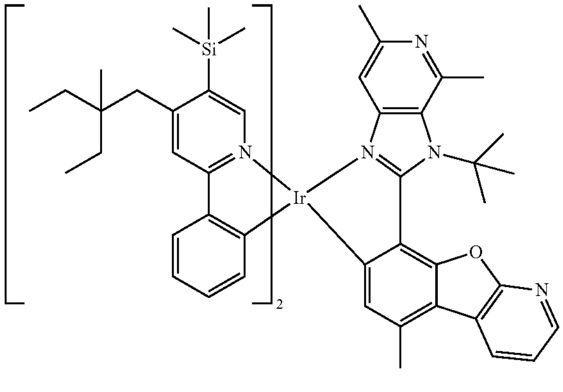

703
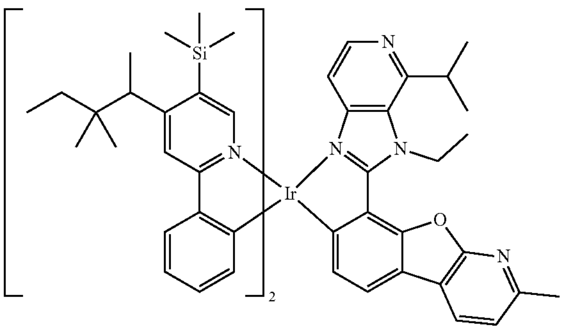
704
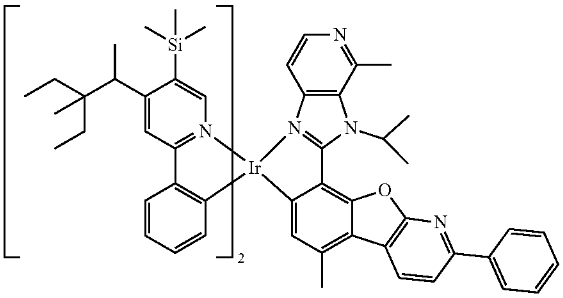
705
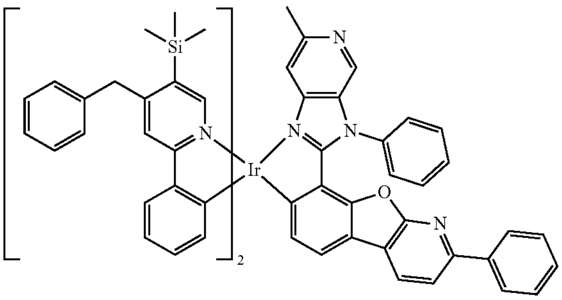
706
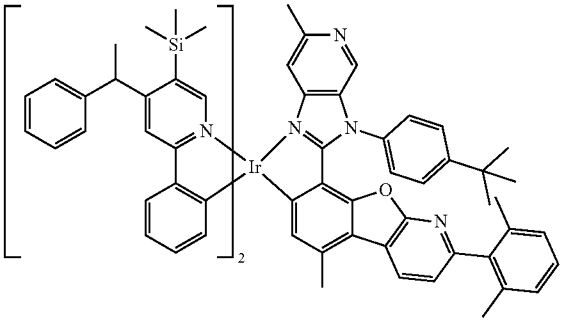
-continued
707
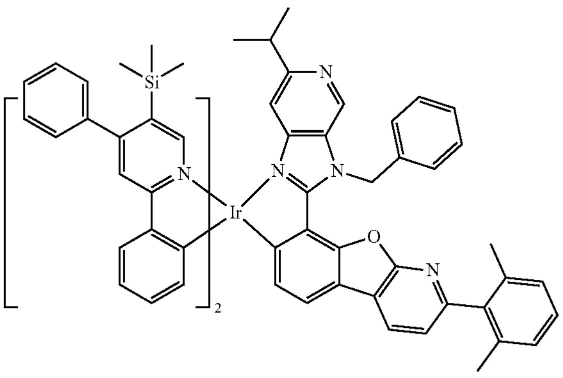
708
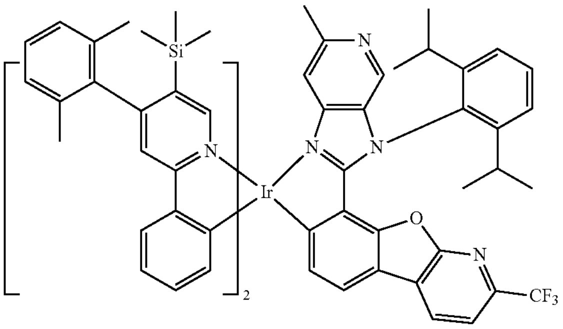
709
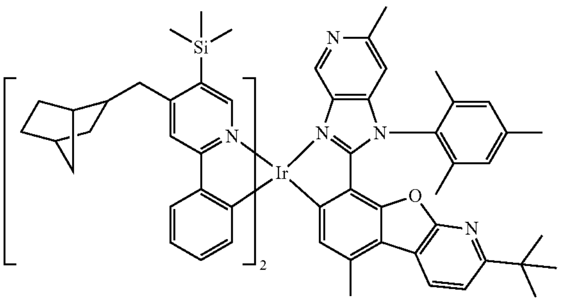
710
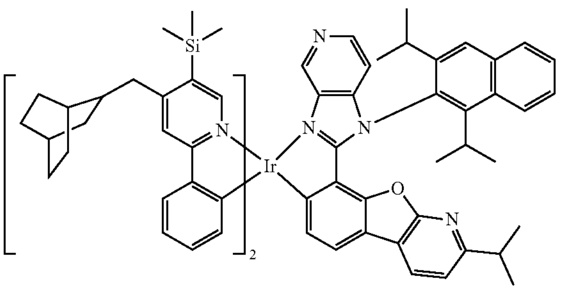

-continued
711
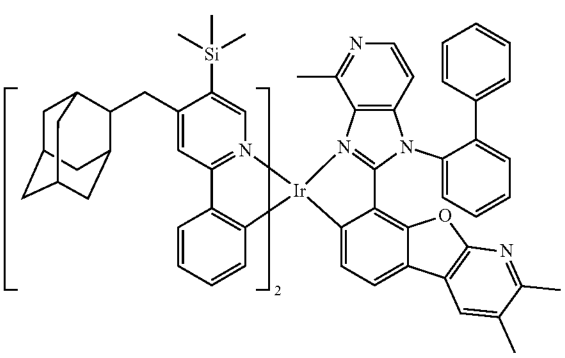
712
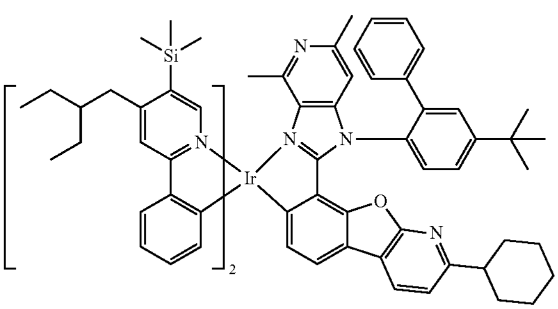
713
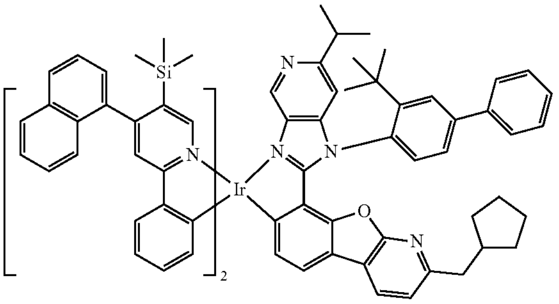
714
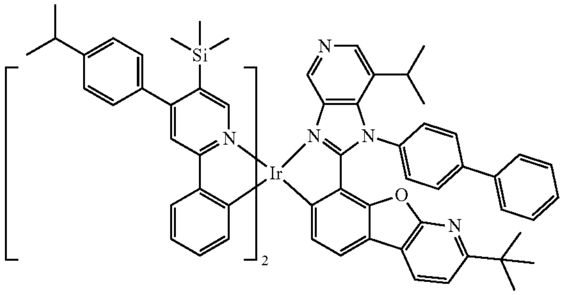
-continued
715
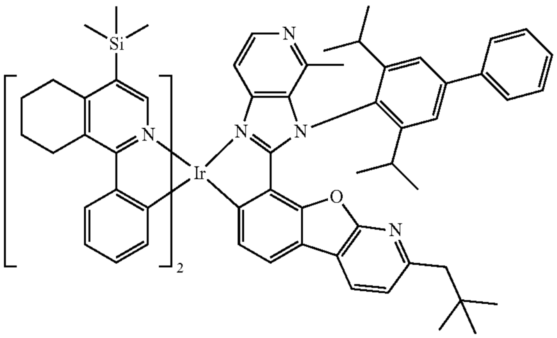
716
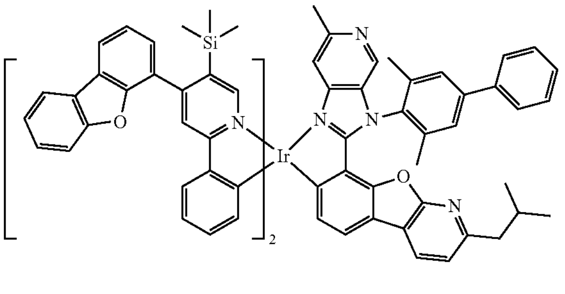
717
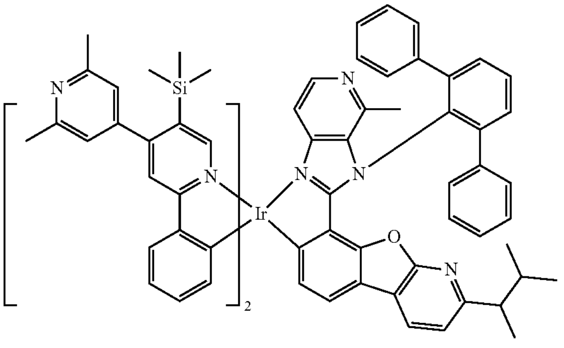
718
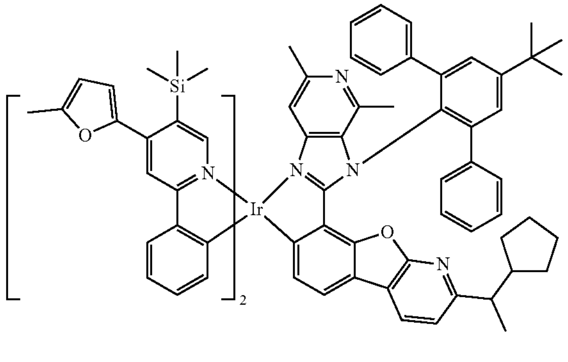

-continued
719
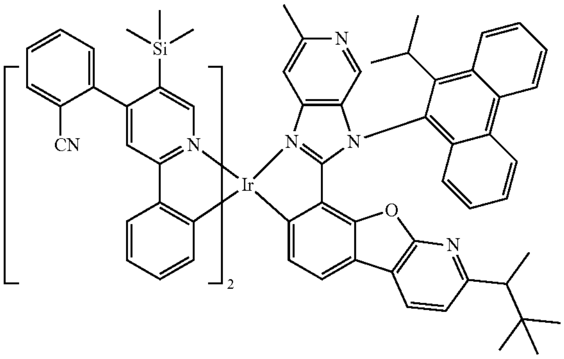
720
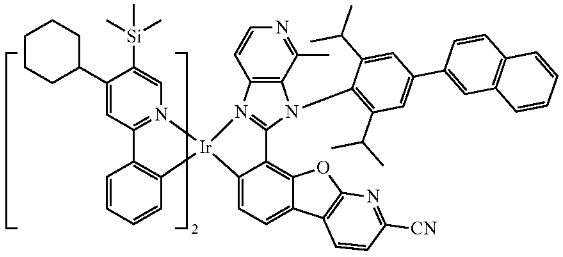
721
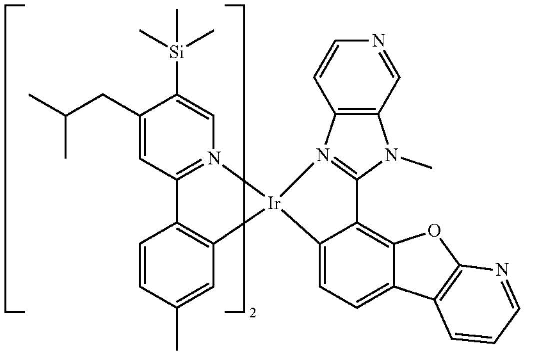
722
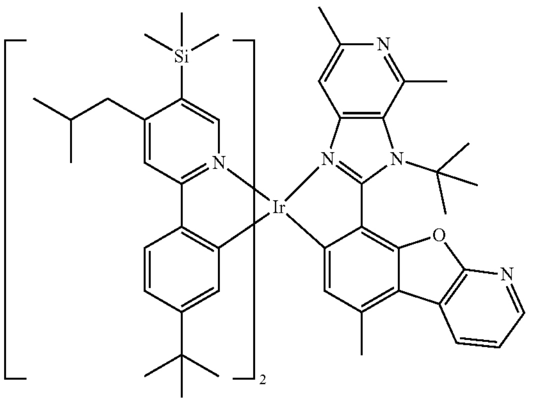
-continued
723
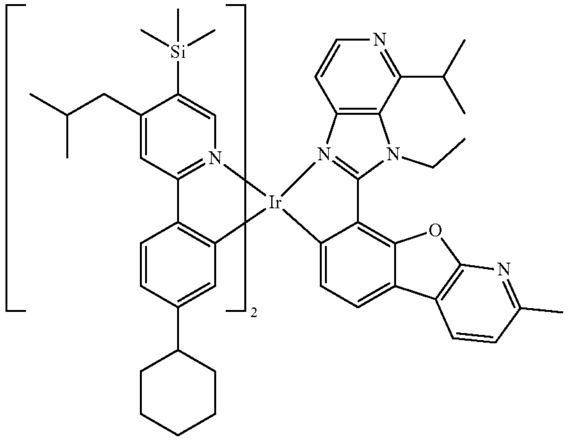
724
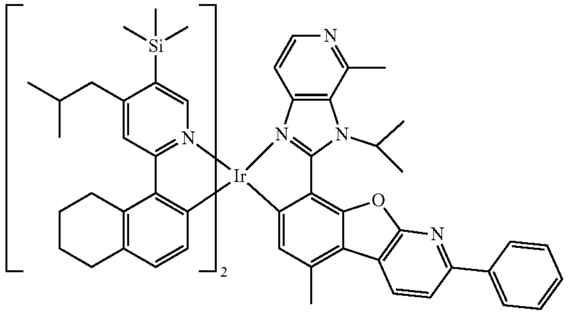
725
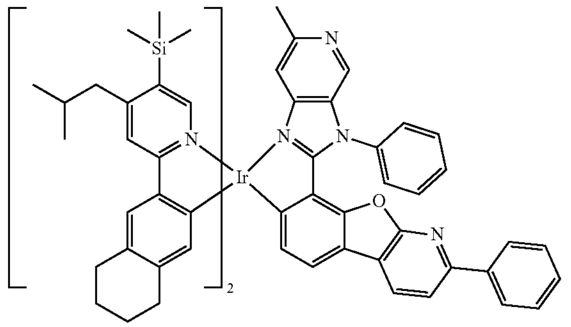
726
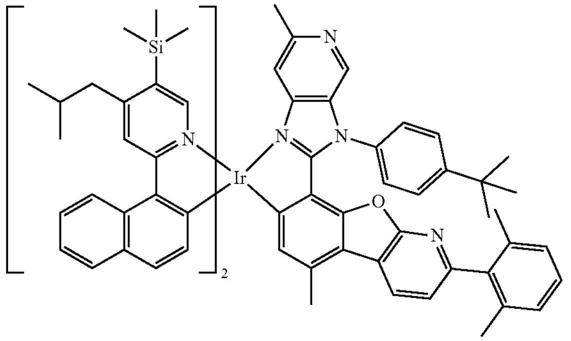

-continued
727
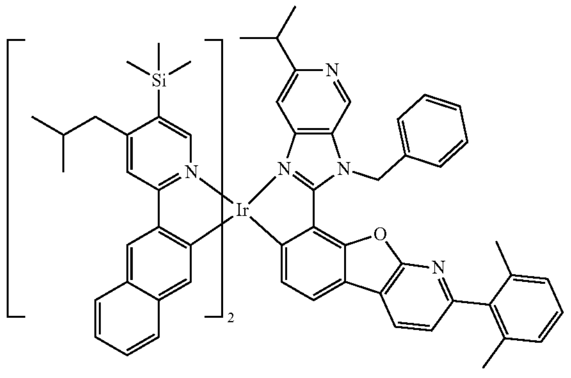
728
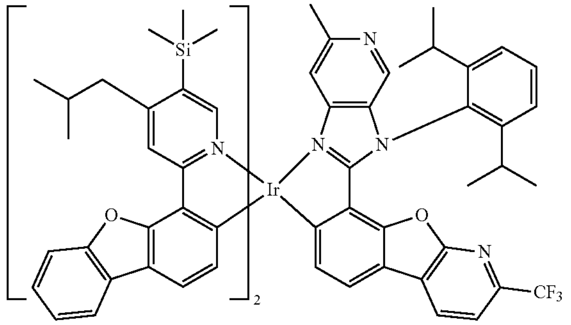
729
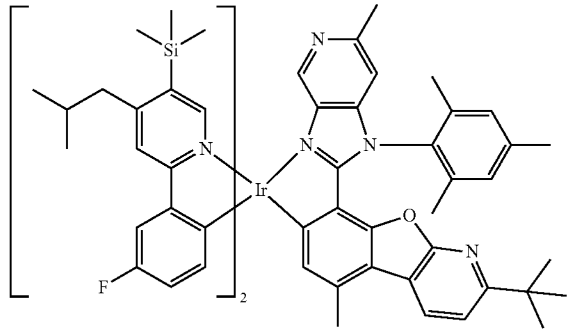
730
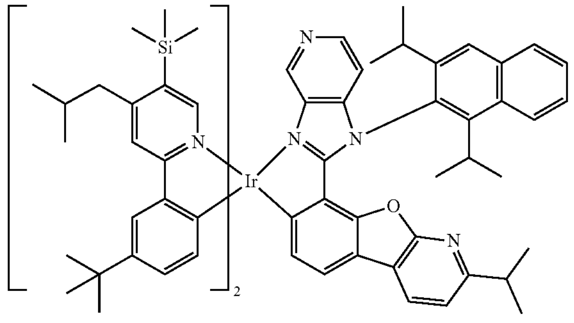
-continued
731
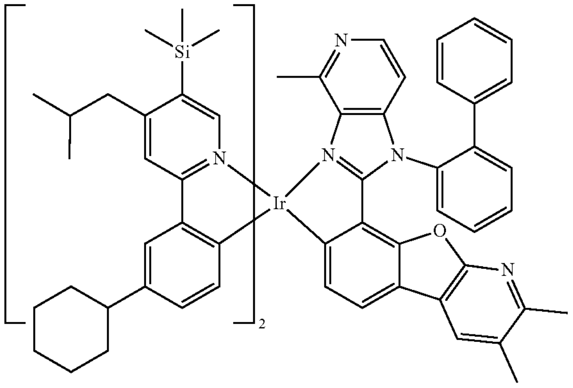
732
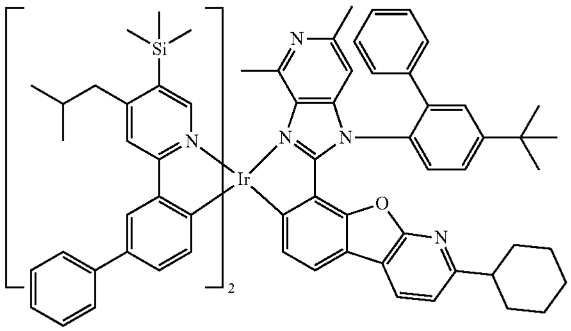
733
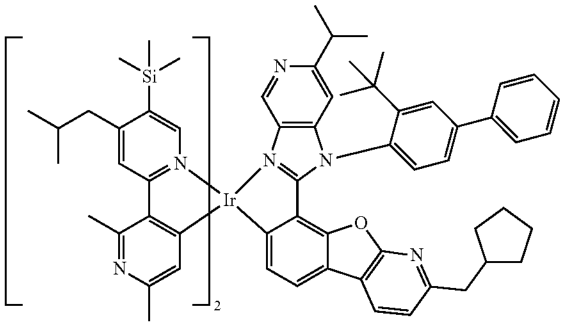
734
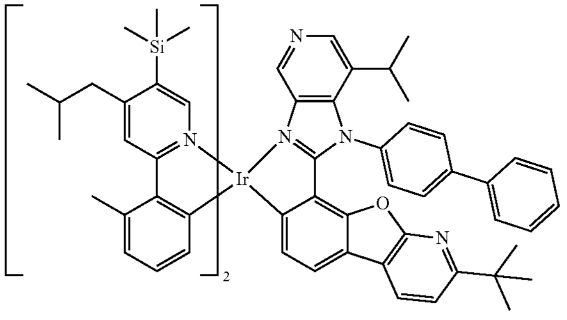

-continued
735
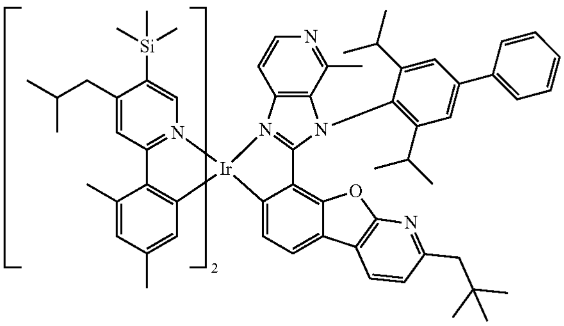
736
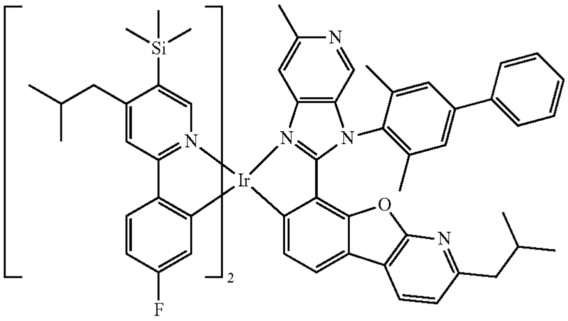
737
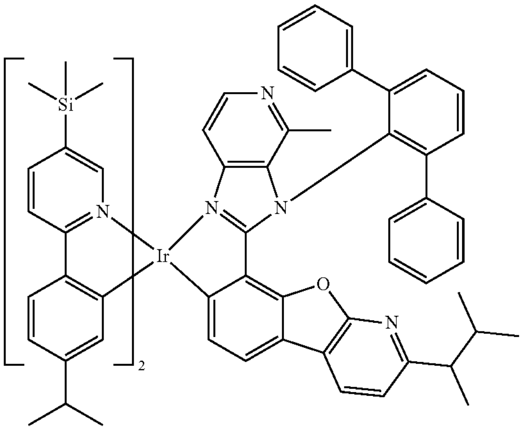
738
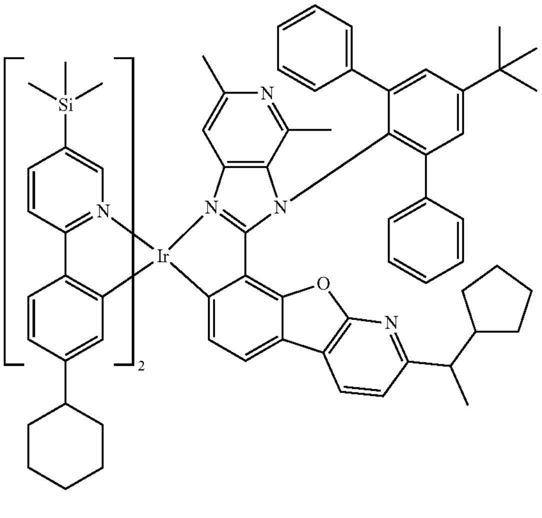
-continued
739
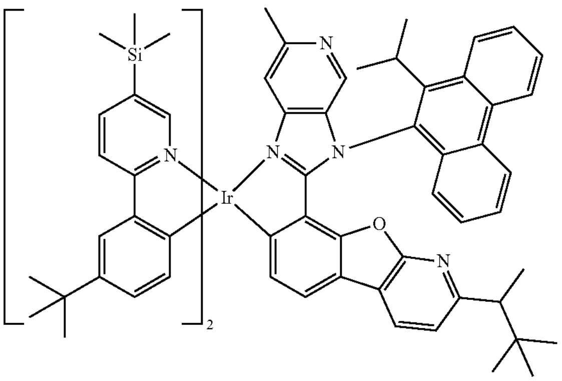
740
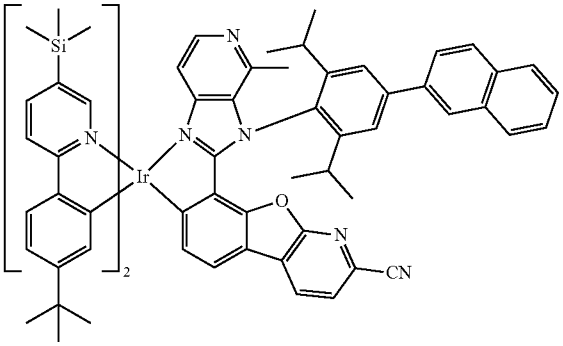
741
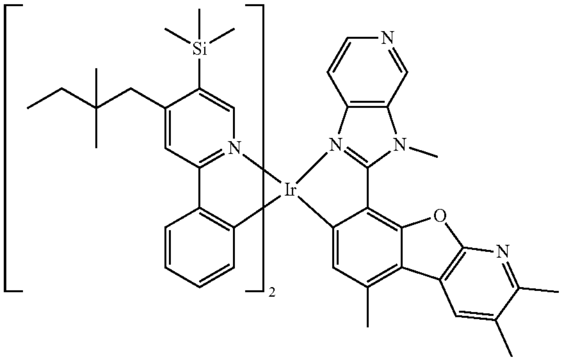
742
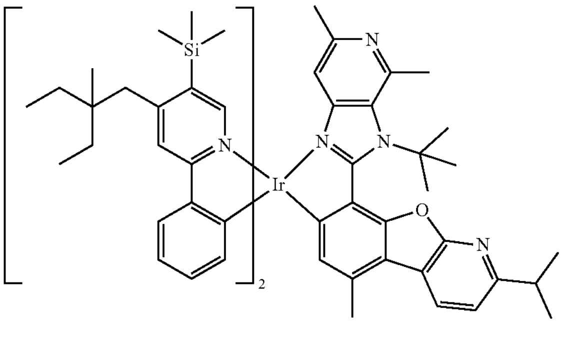

743
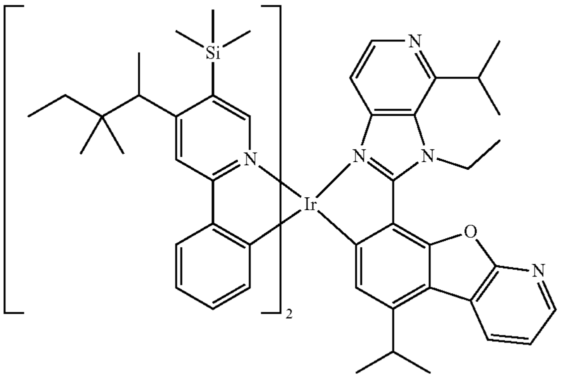
744
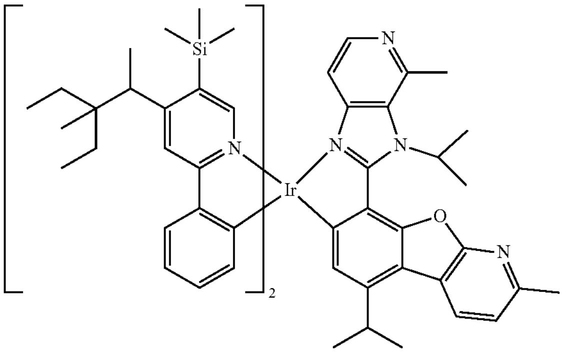
745
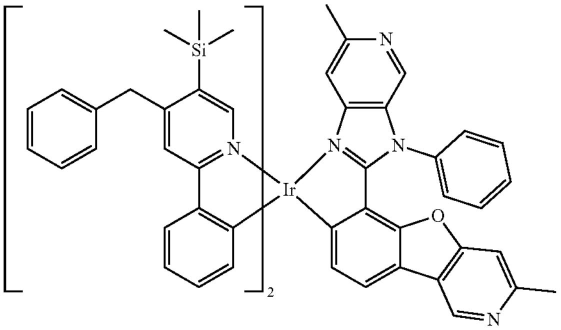
746
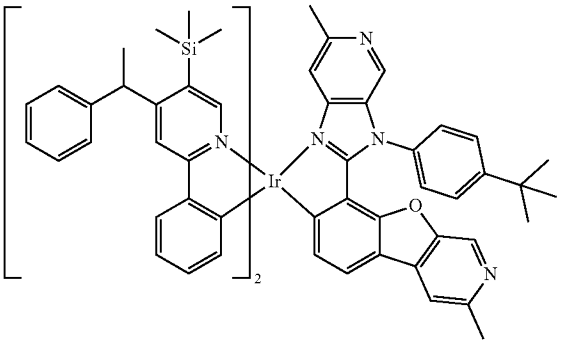
747
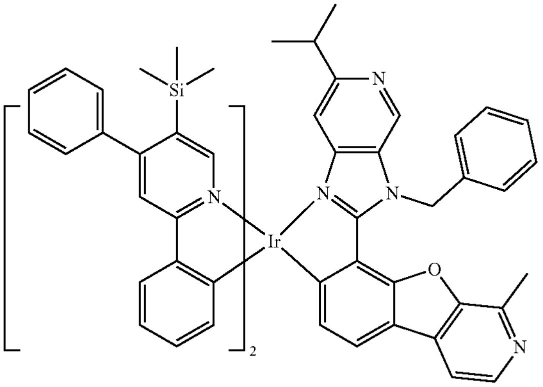
748
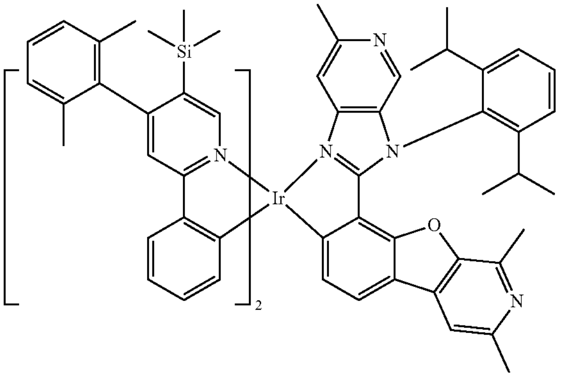
749
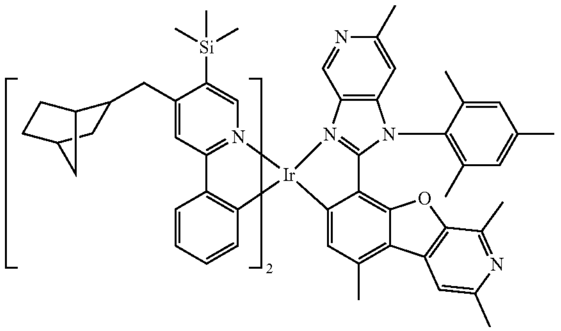
750
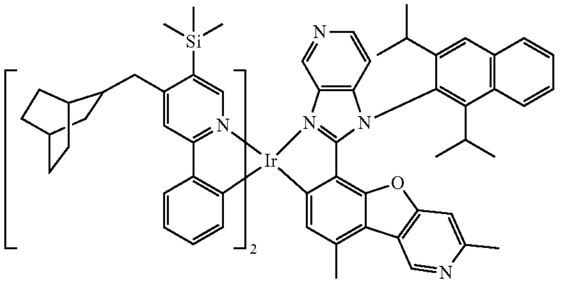

-continued
751
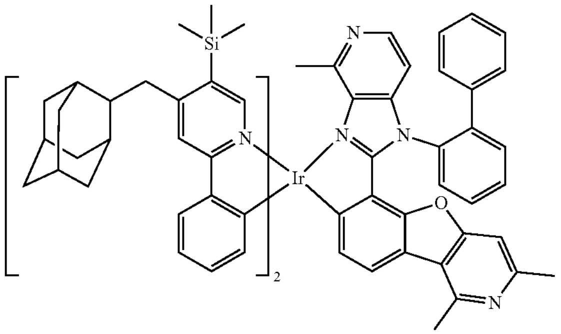
752
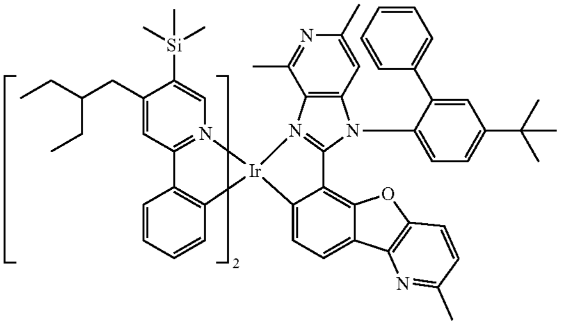
753
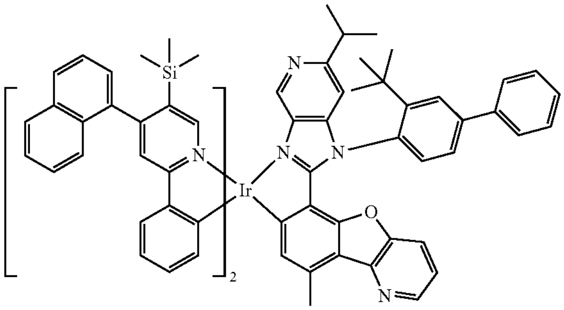
754
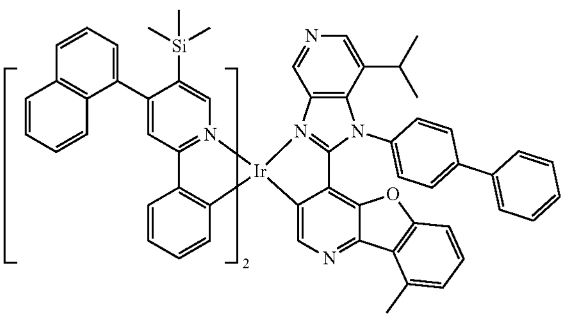
-continued
755
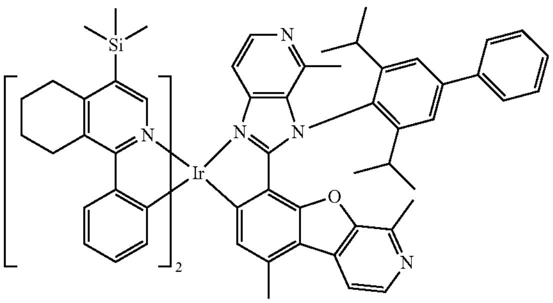
756
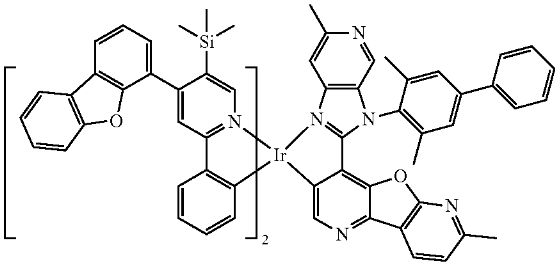
757
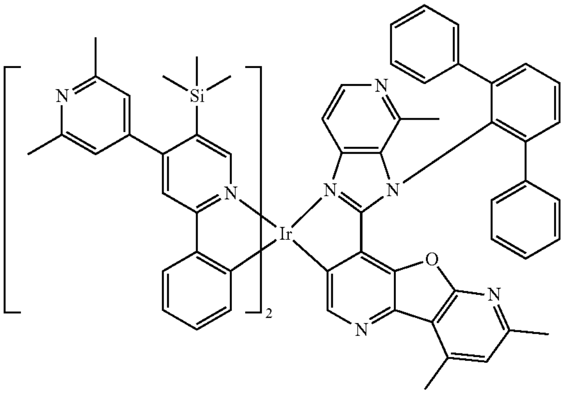
758
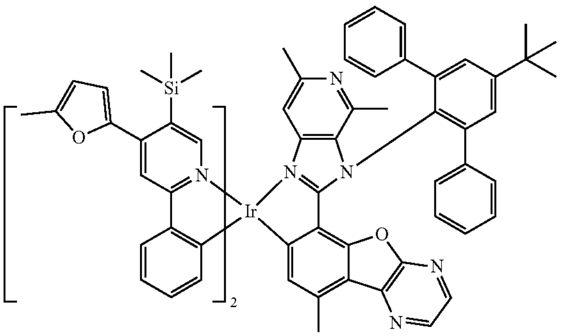

-continued
759
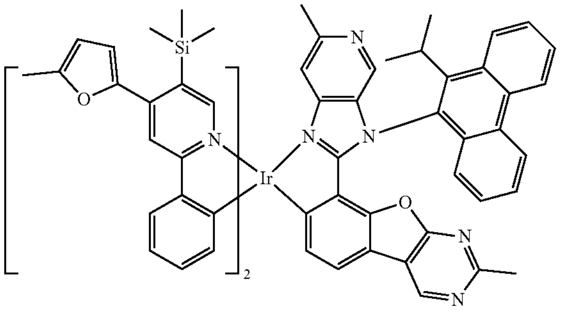
760
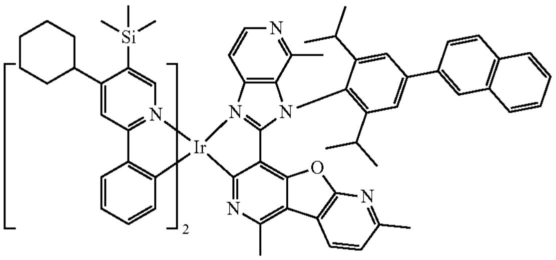
761
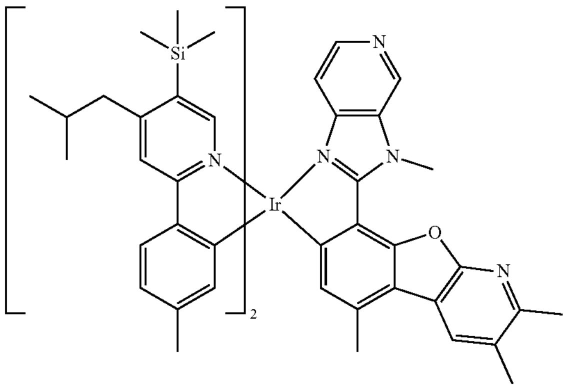
762
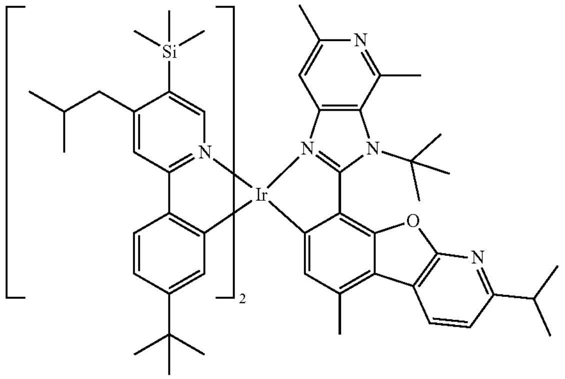
-continued
763
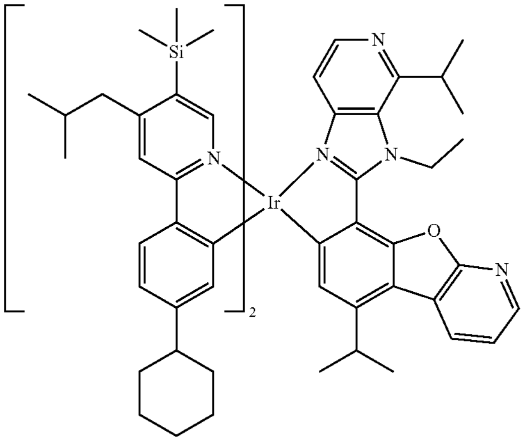
764
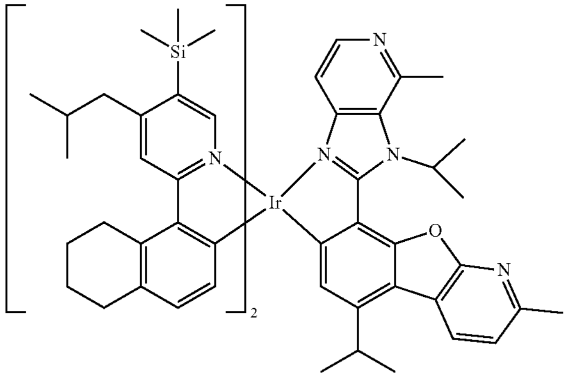
765
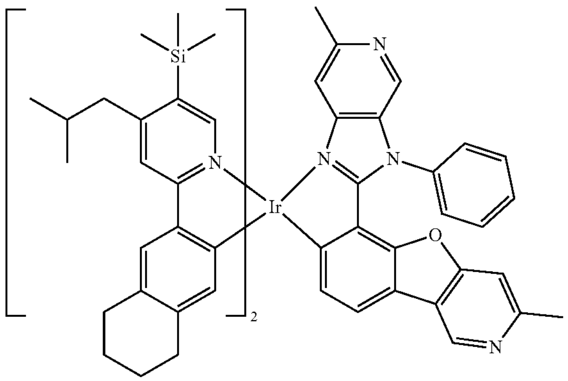
766
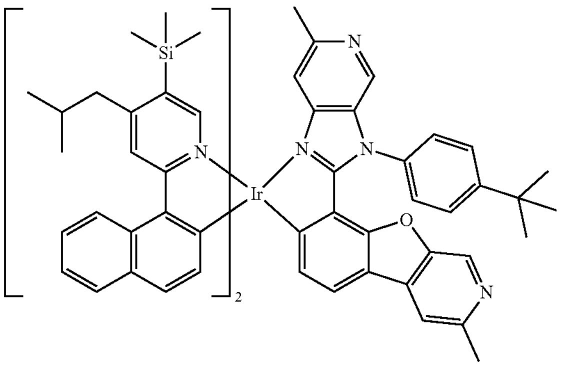

-continued
767
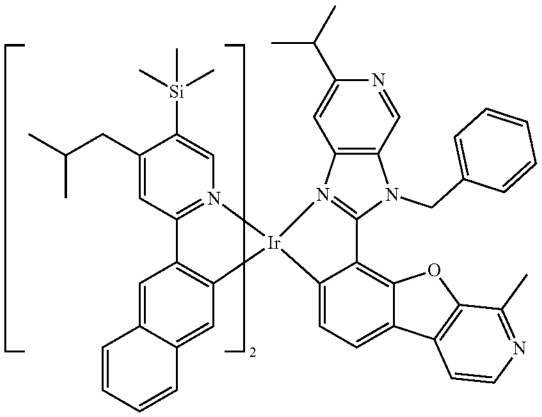
768
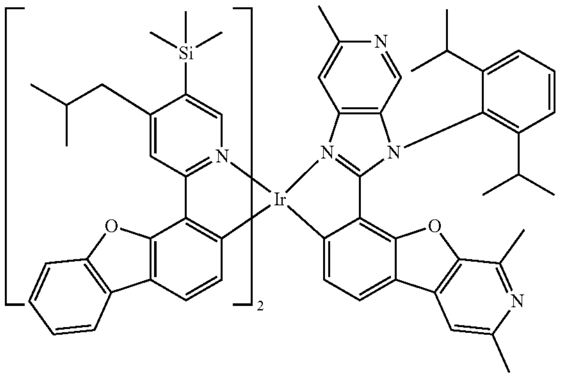
769
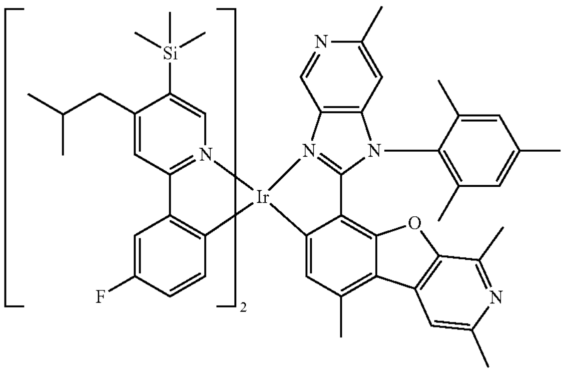
770
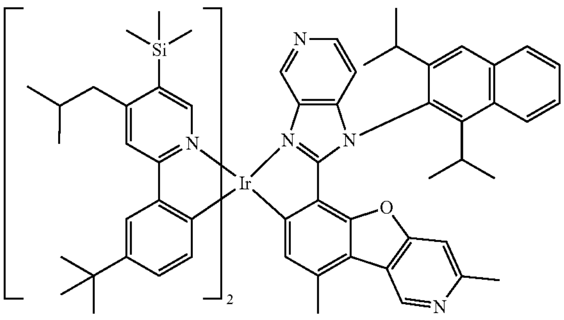
-continued
771
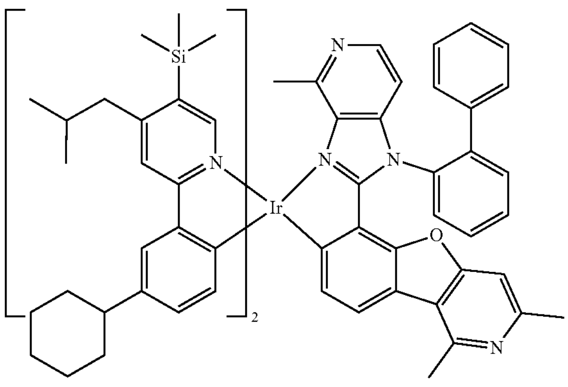
772
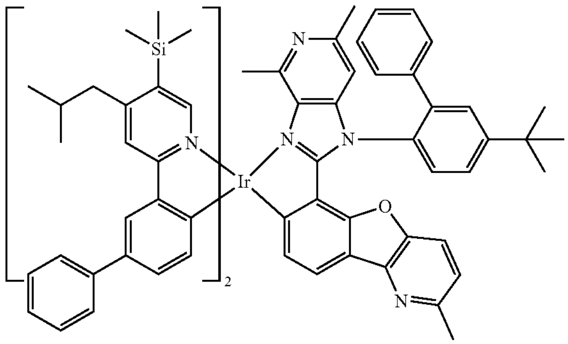
773
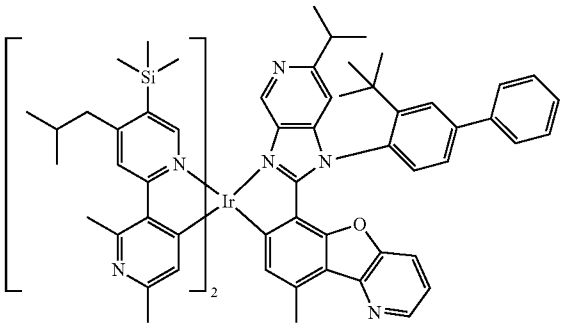
774
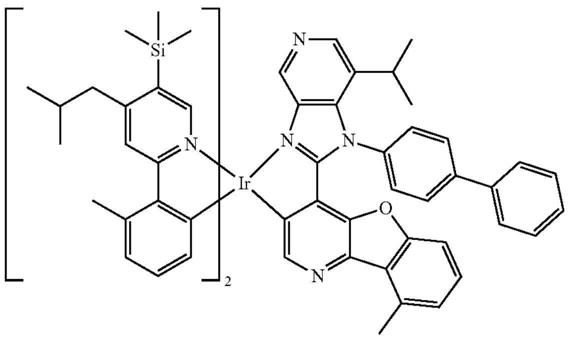

-continued
775
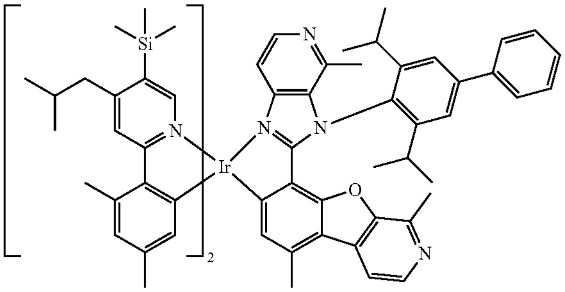
776
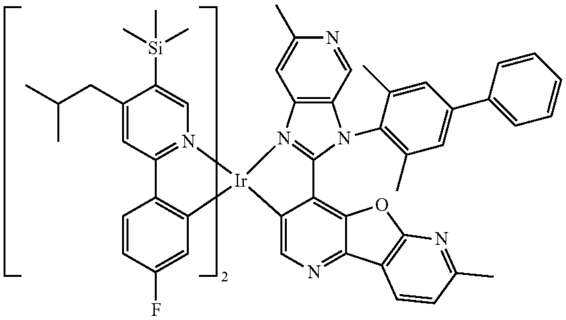
777
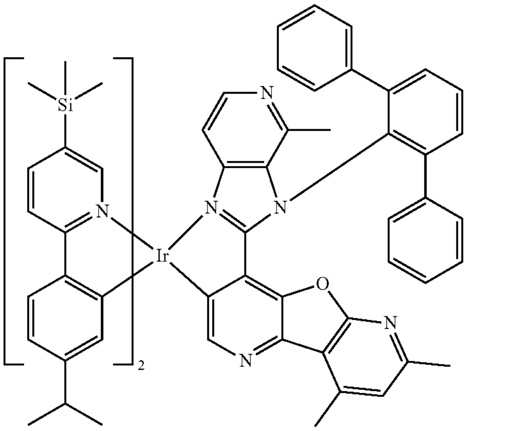
778
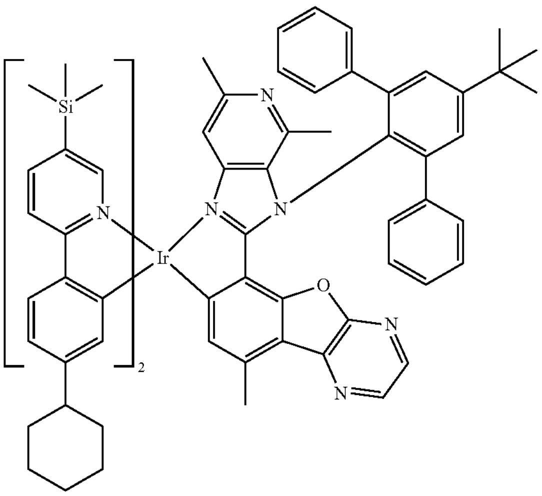
-continued
779
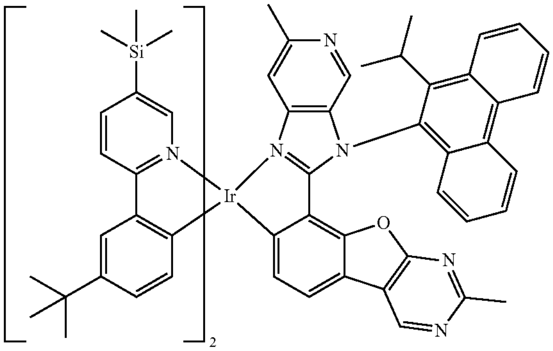
780
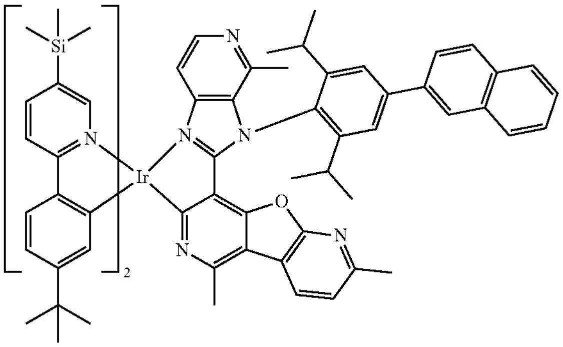
781
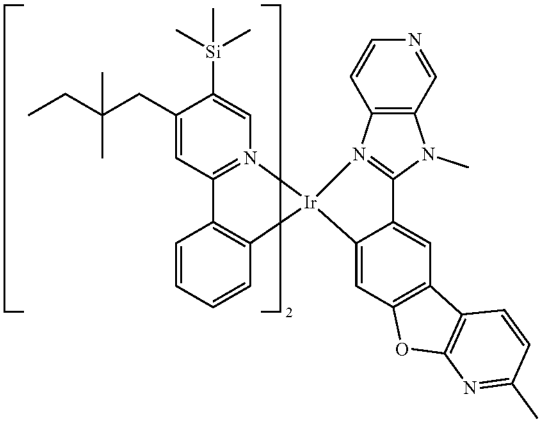
782
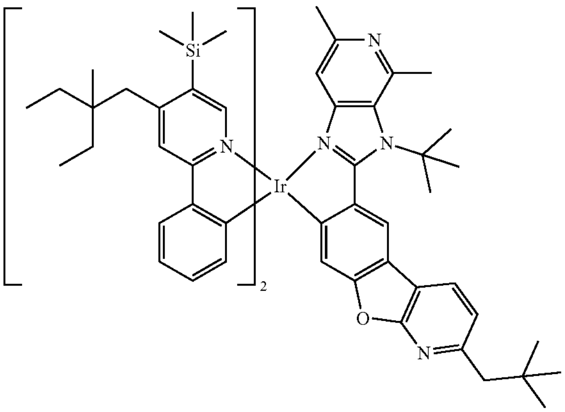

-continued
783
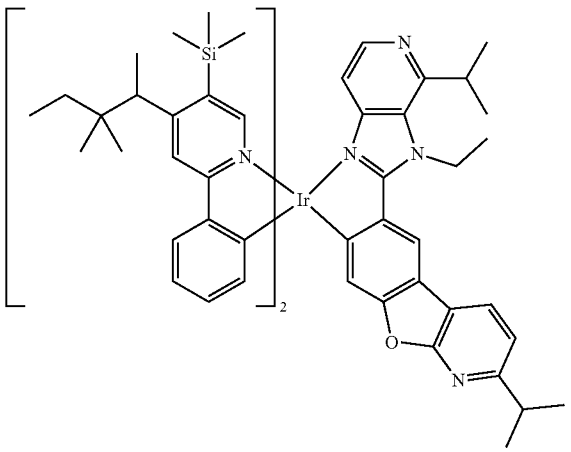
784
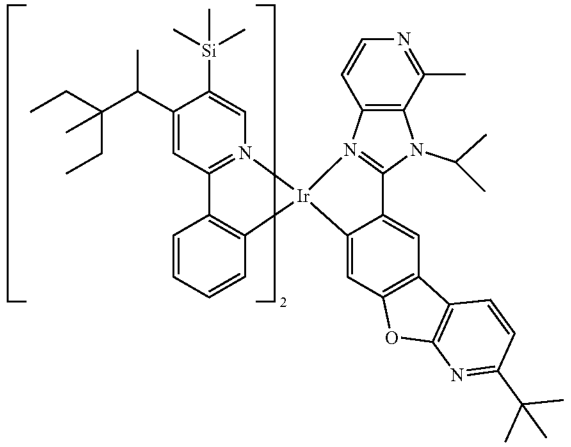
785
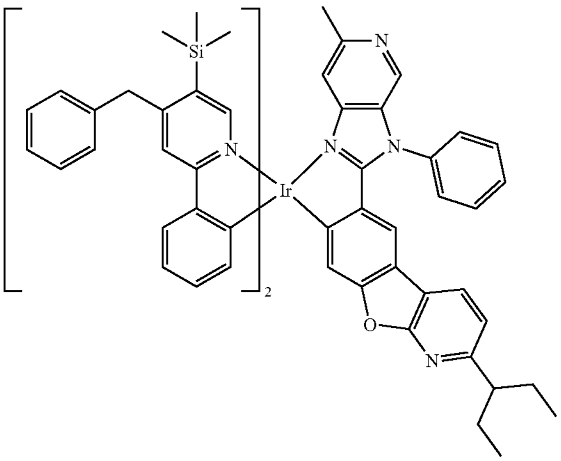
-continued
786
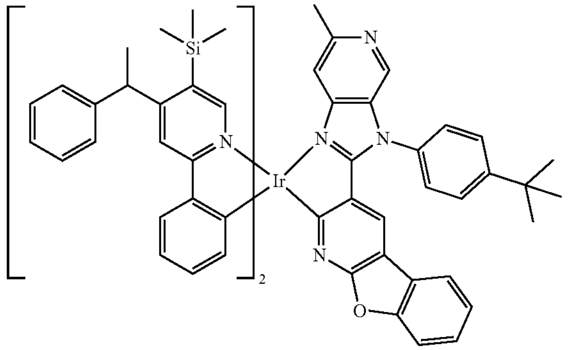
787
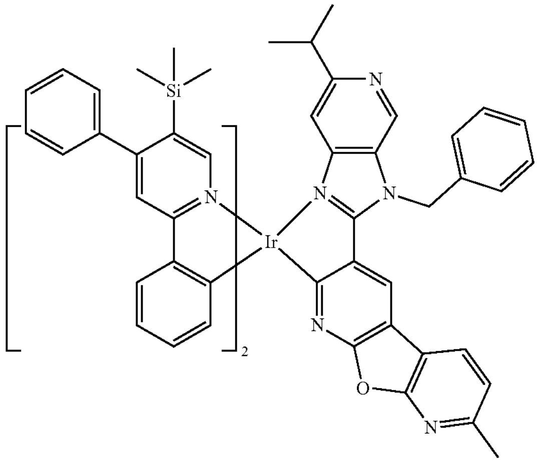
788
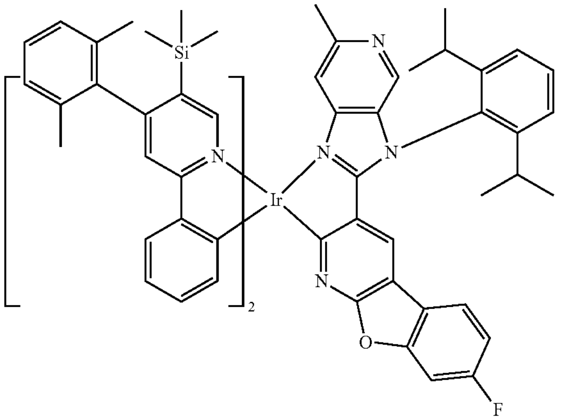

-continued
789
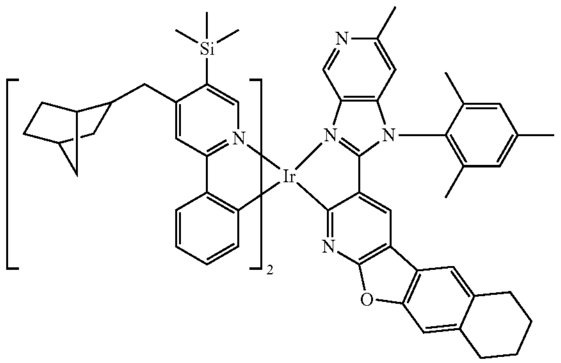
790
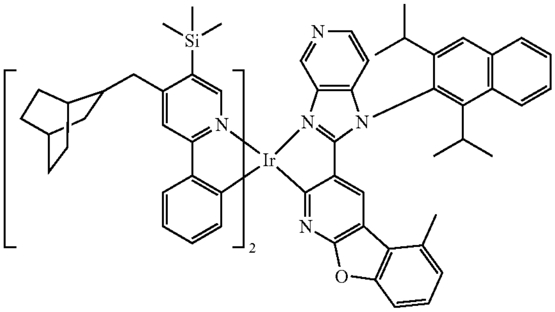
791
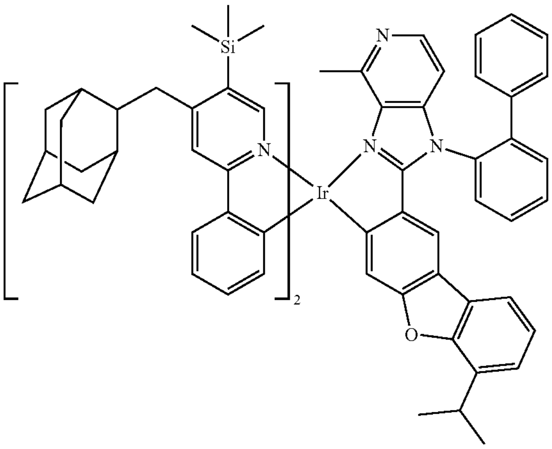
792
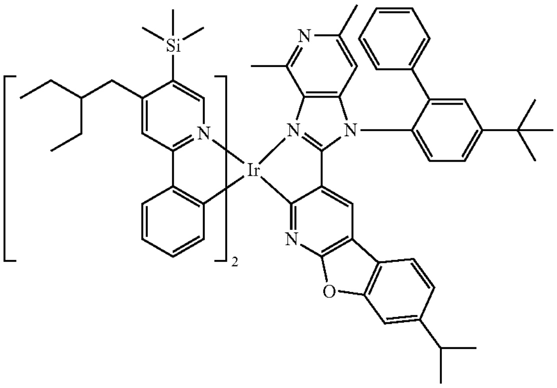
-continued
793
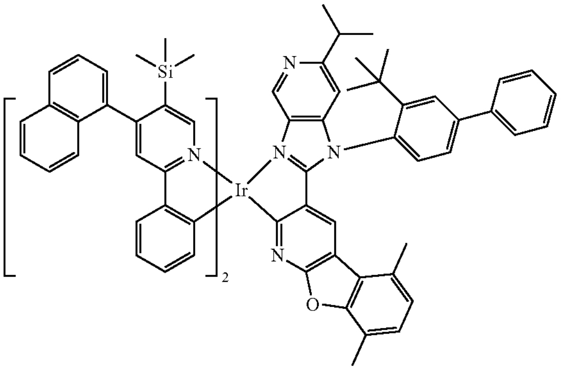
794
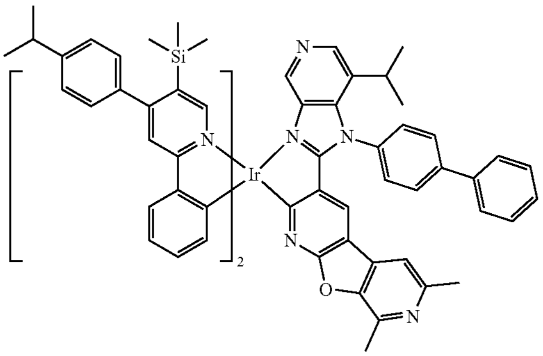
795
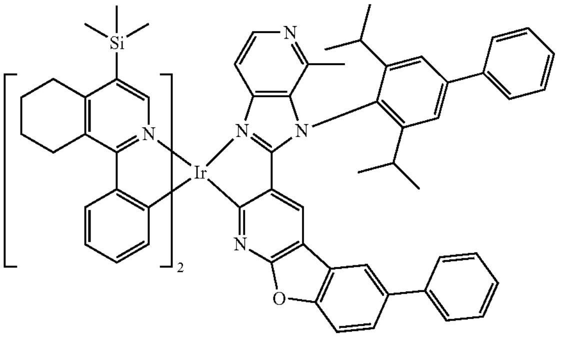
796
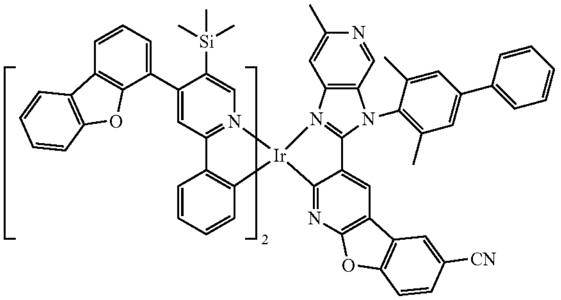

-continued
797
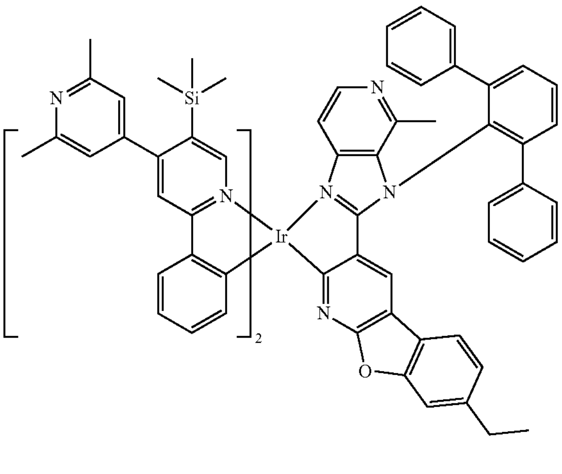
798
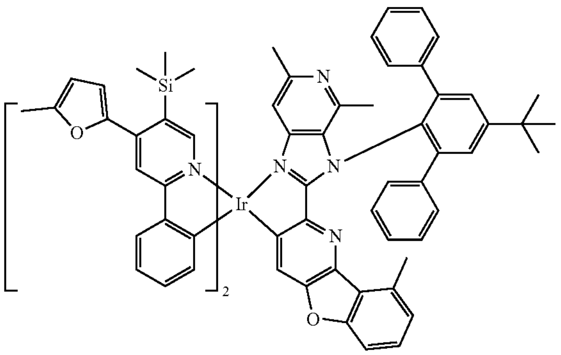
799
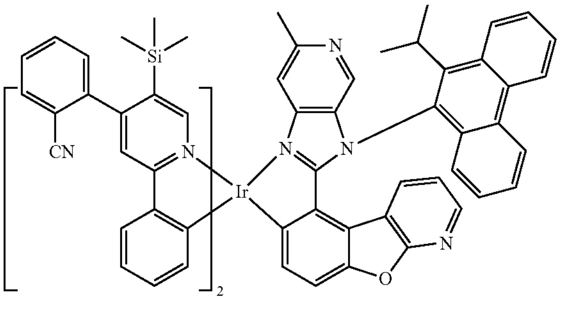
800
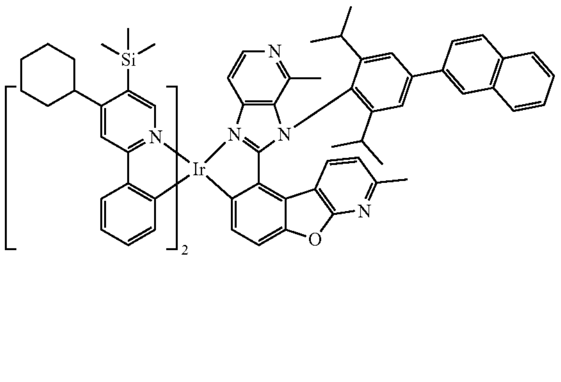
801
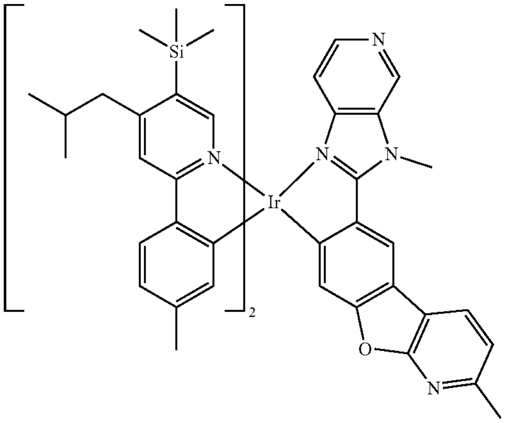
802
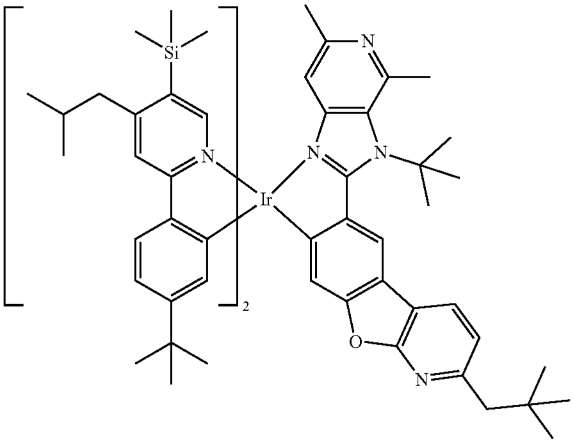
803
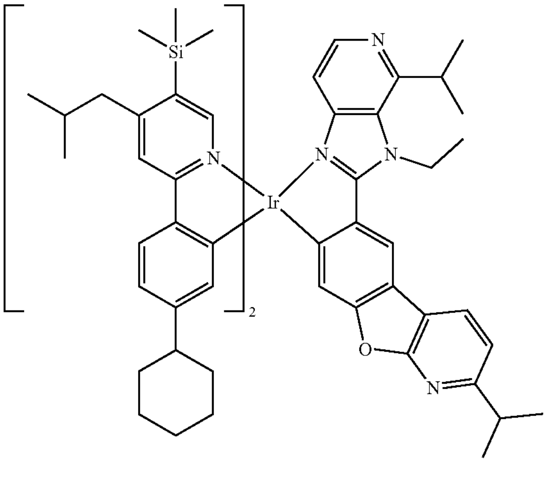

-continued
804
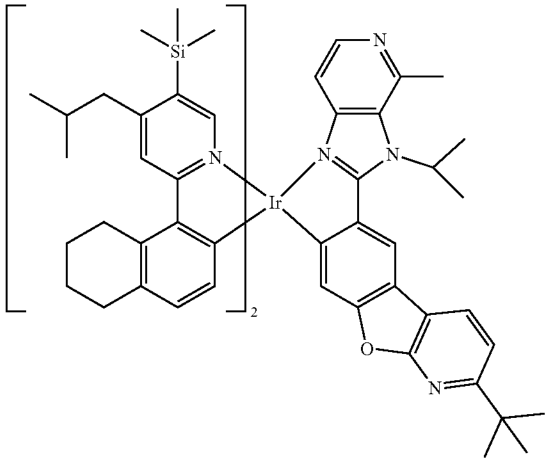
805
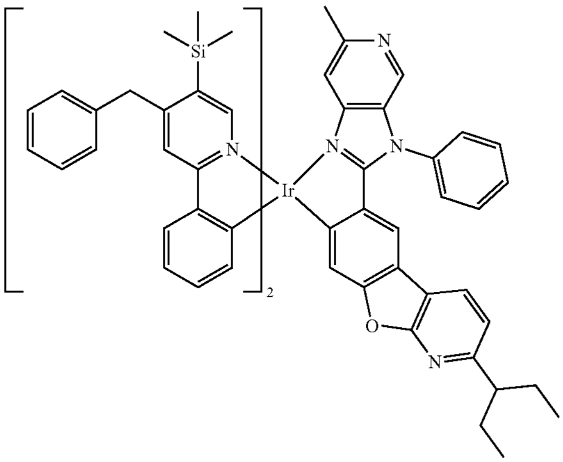
806
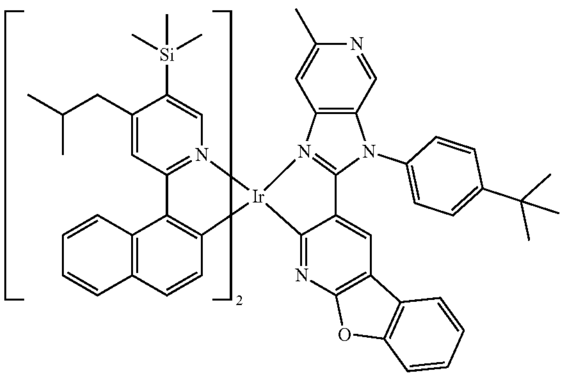
-continued
807
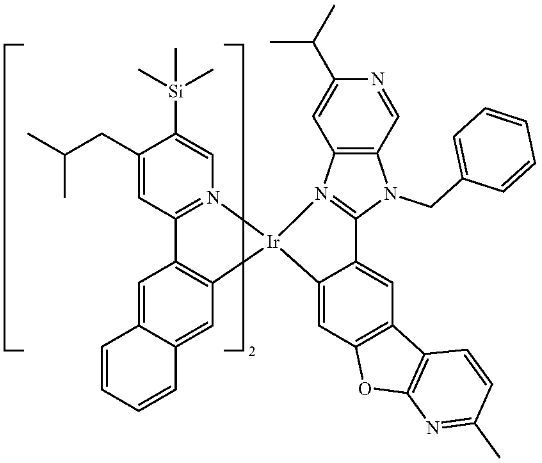
808
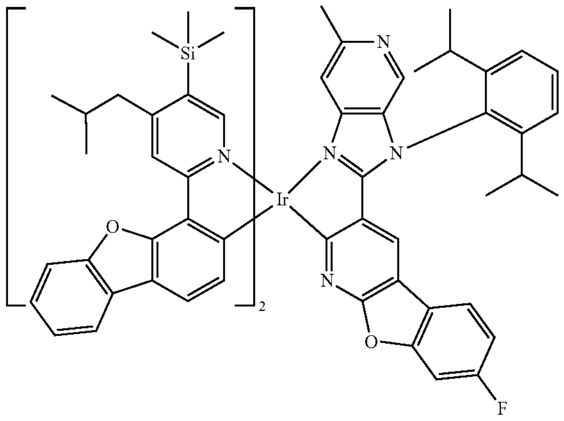
809
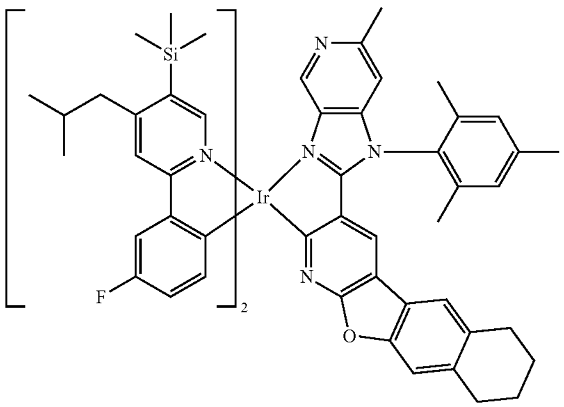

-continued
810
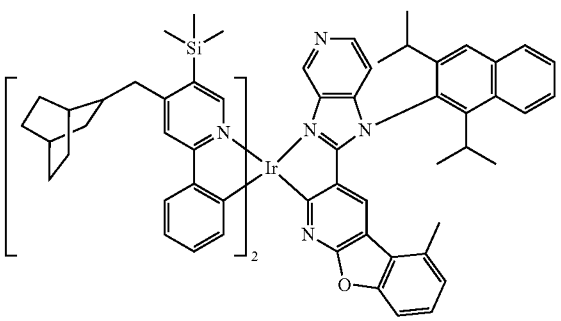
811
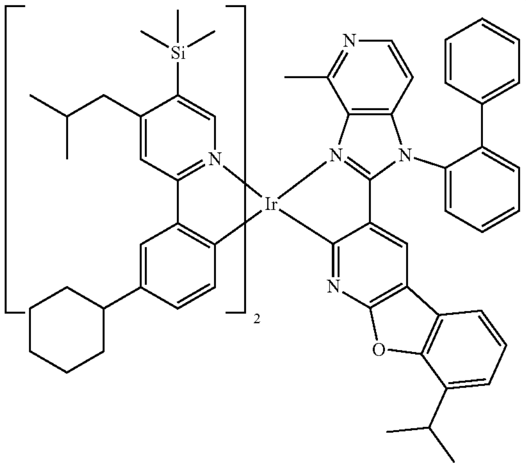
812
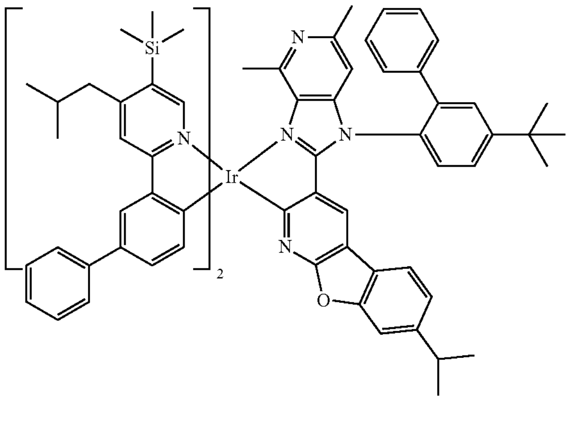
-continued
813
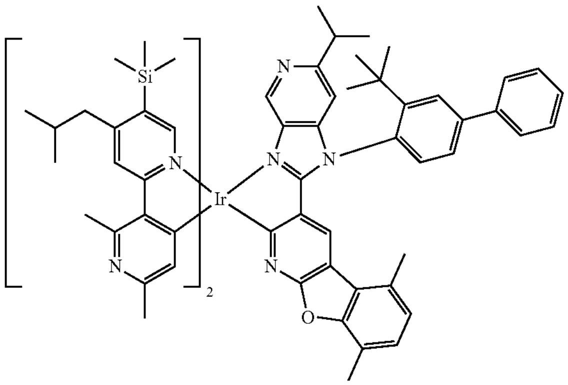
814
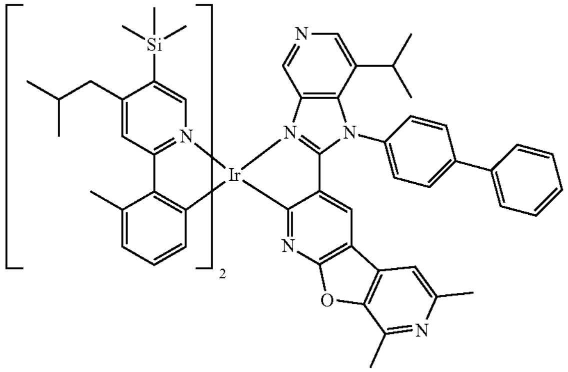
815
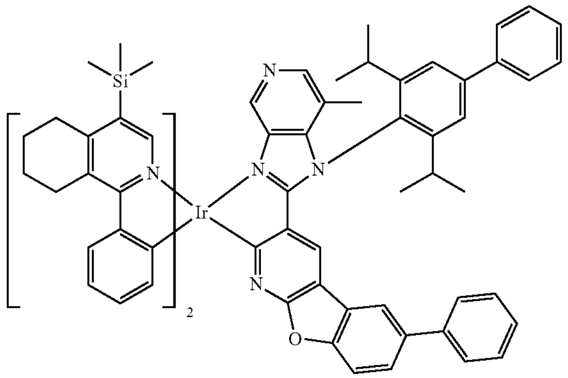
816
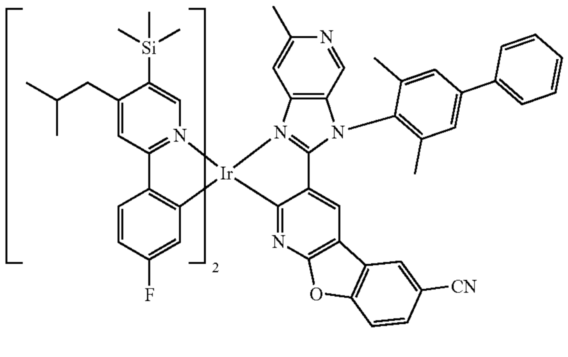

817
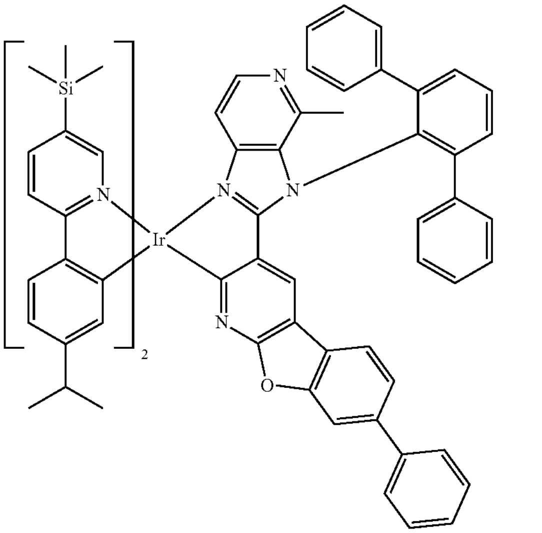
818
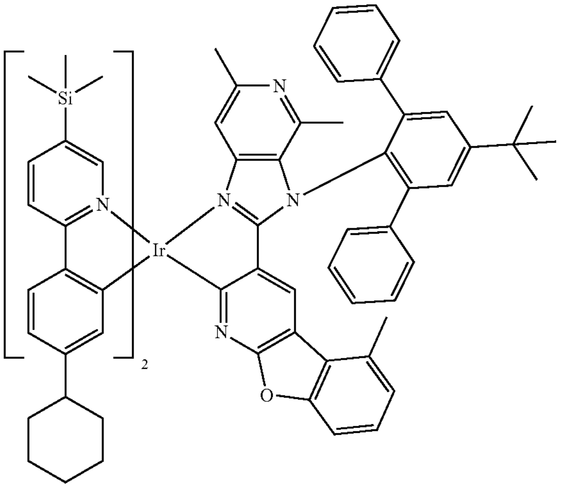
819
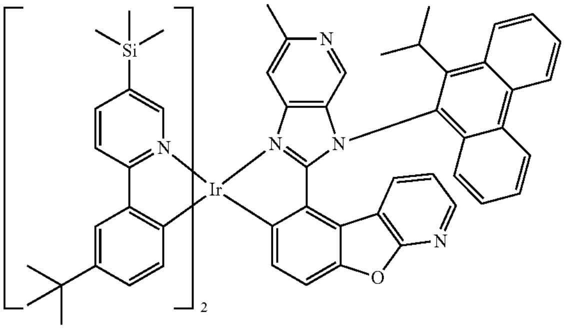
820
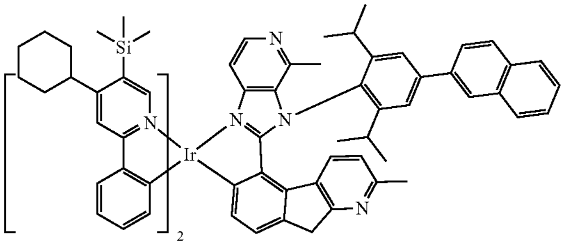
821
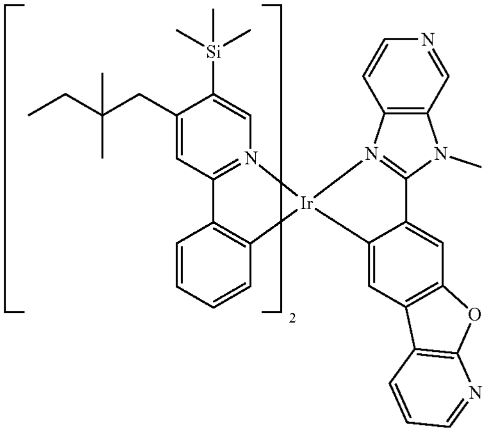
822
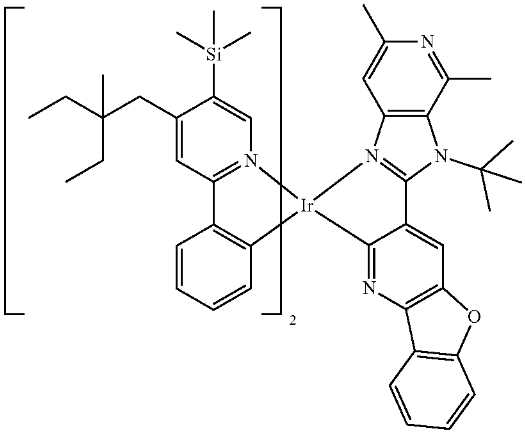
823
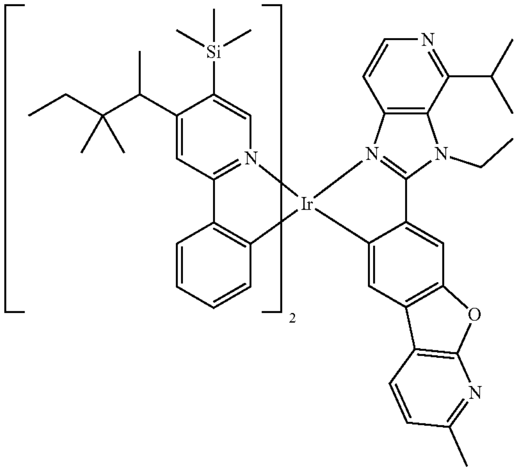

-continued
824
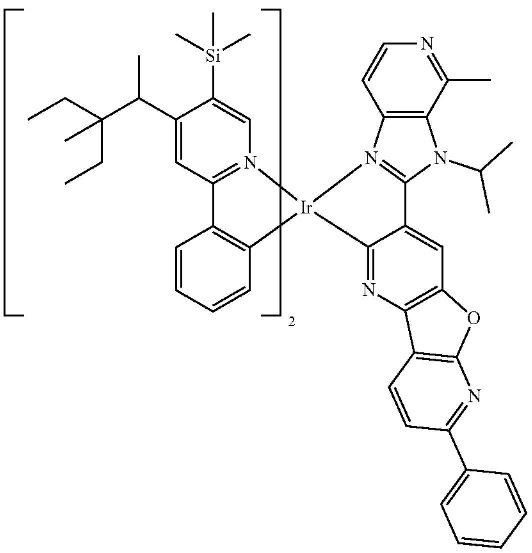
825
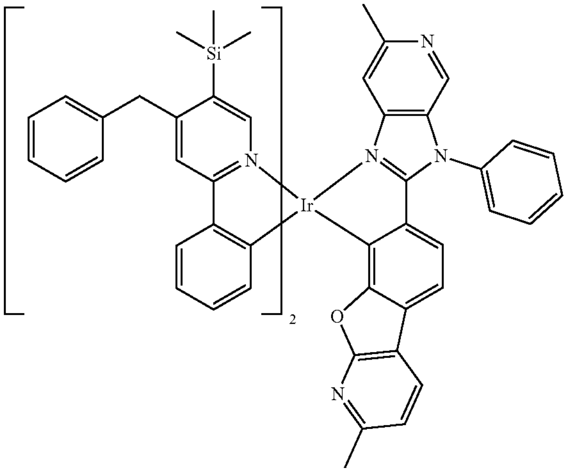
826
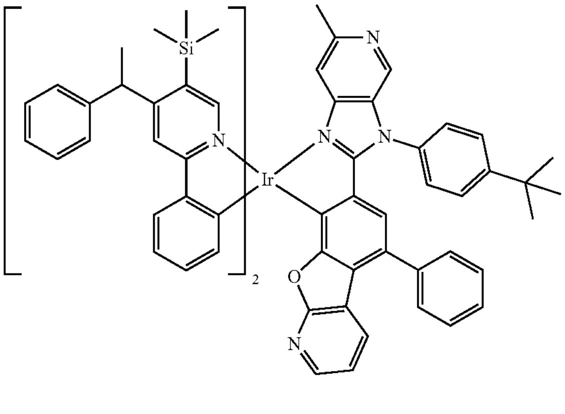
-continued
827
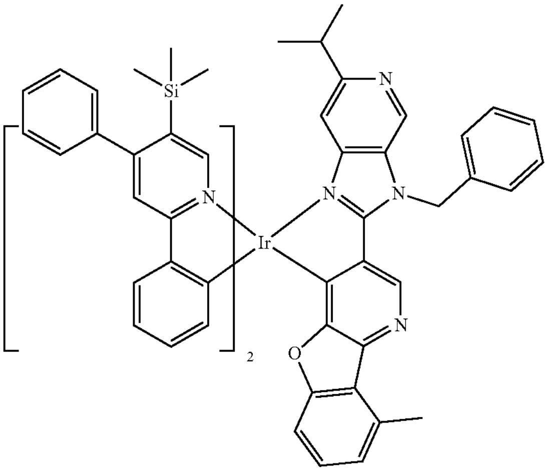
828
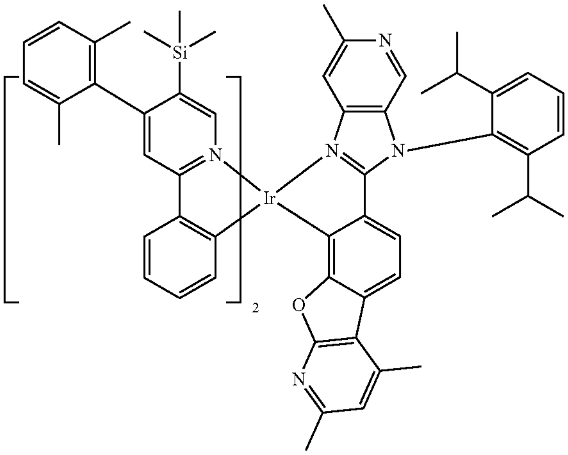
829
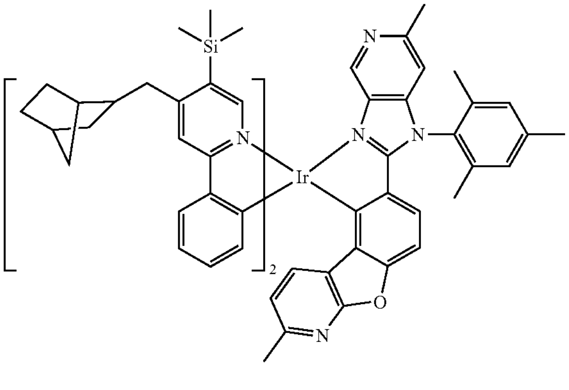

-continued
830
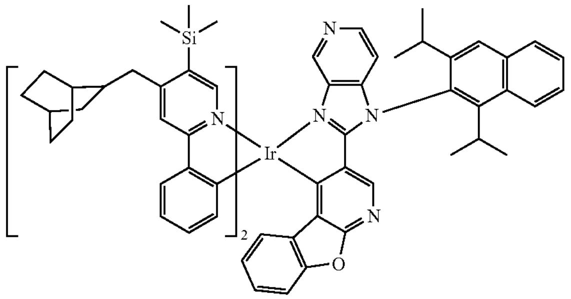
831
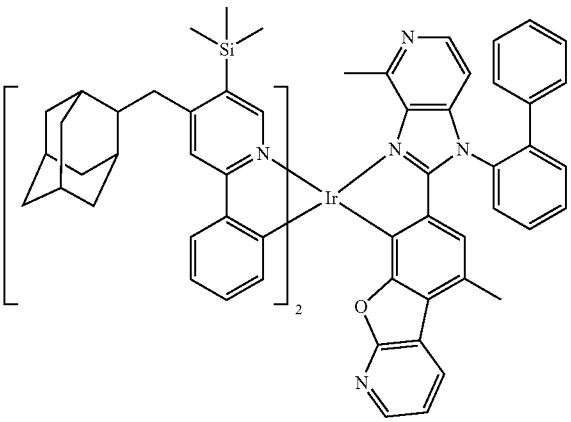
832
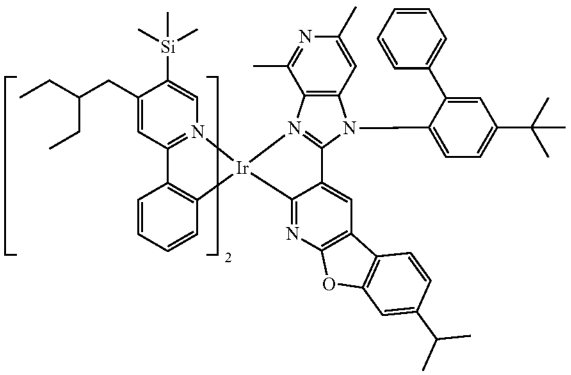
833
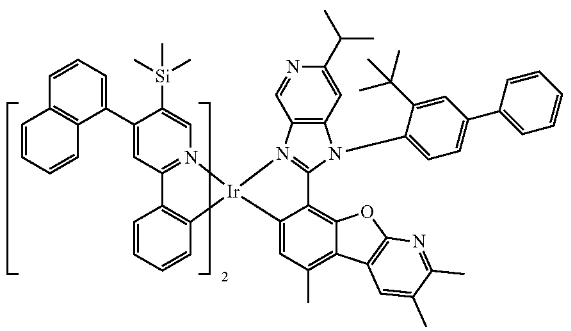
-continued
834
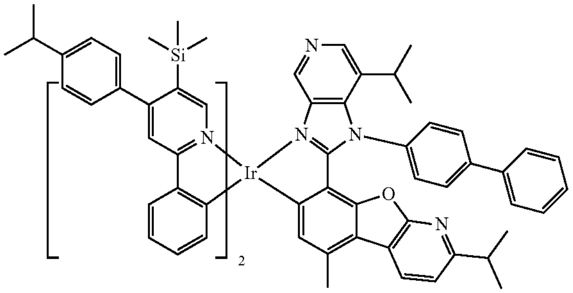
835
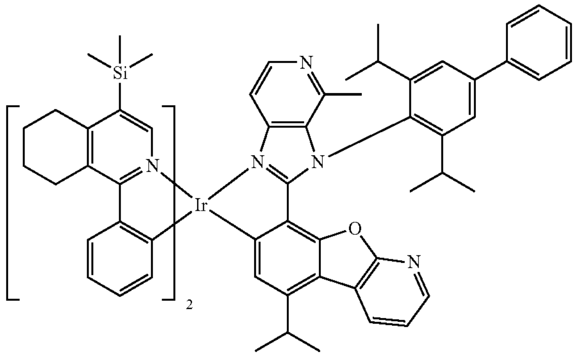
836
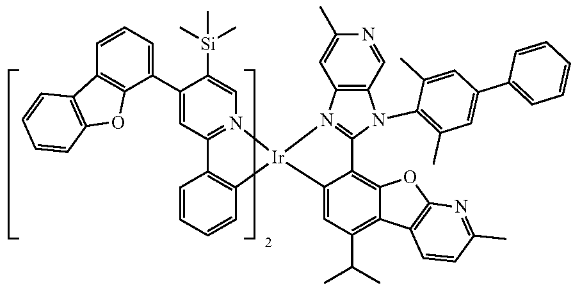
837
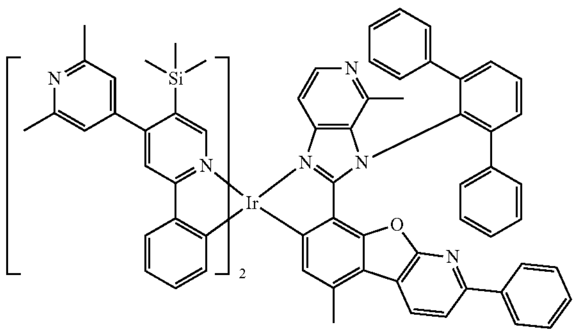

-continued
838
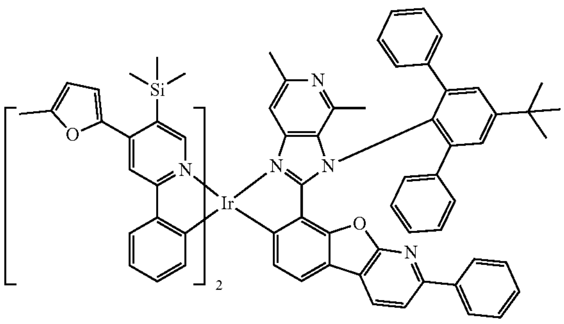
839
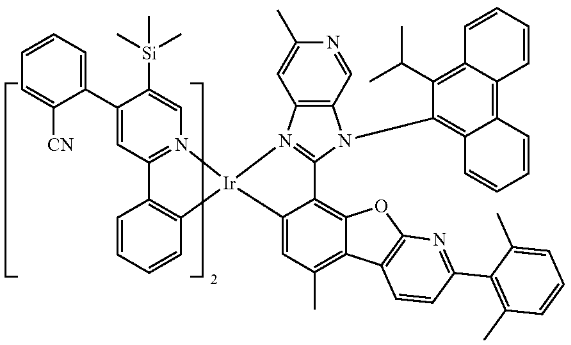
840
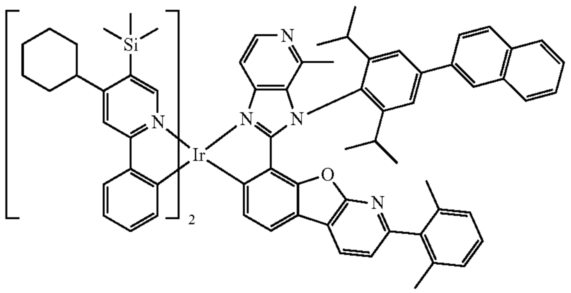
841
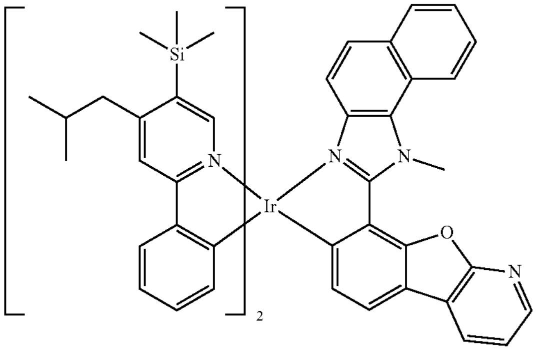
-continued
842
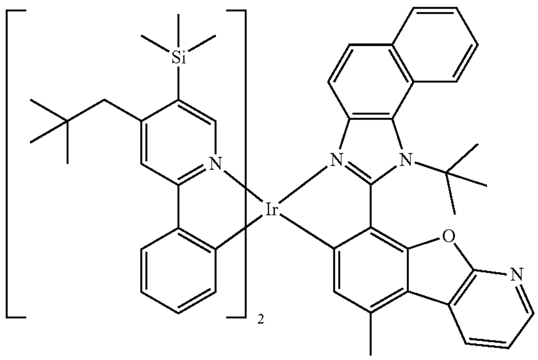
843
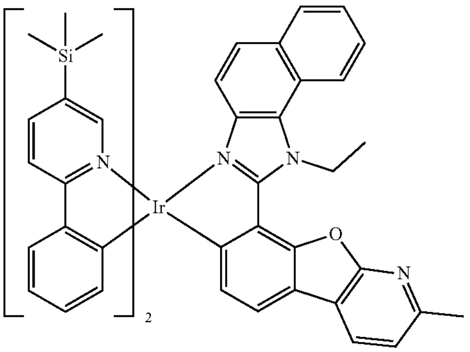
844
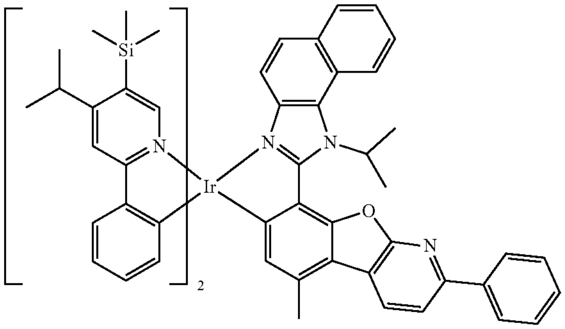
845
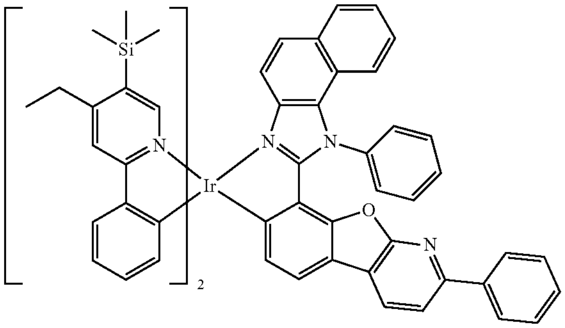

-continued
846
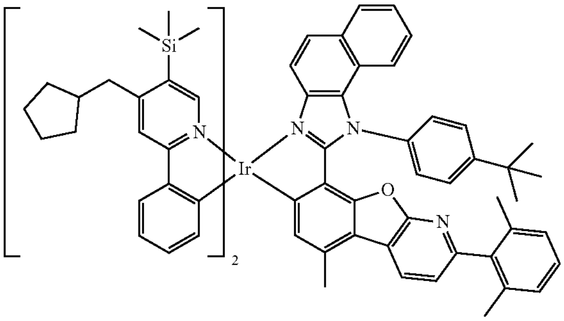
847
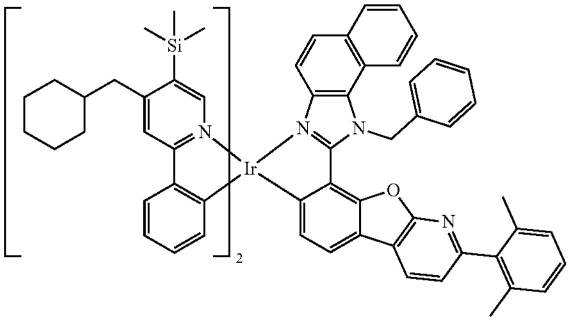
848
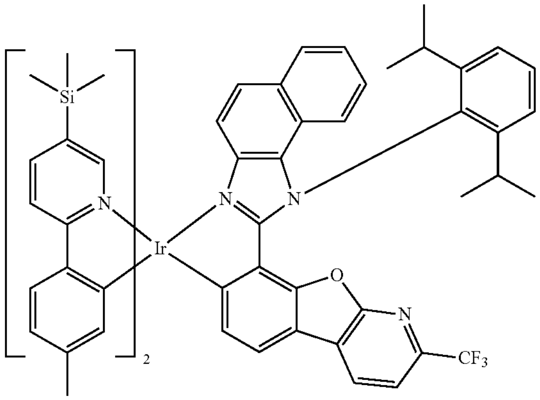
849
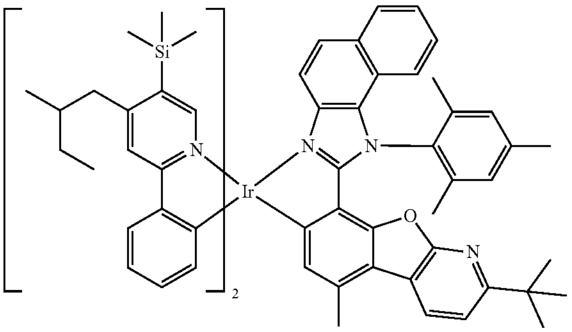
-continued
850
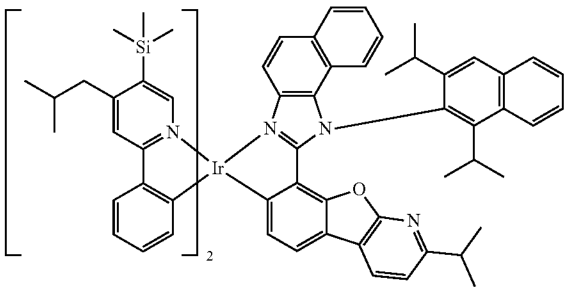
851
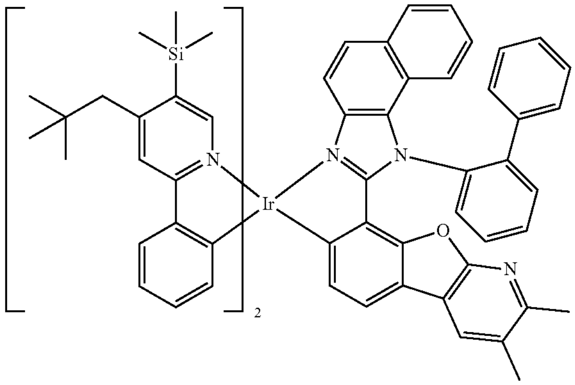
852
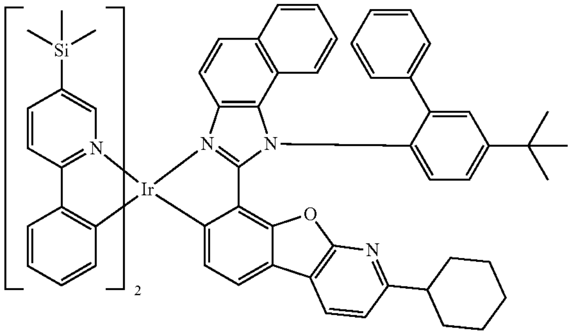
853
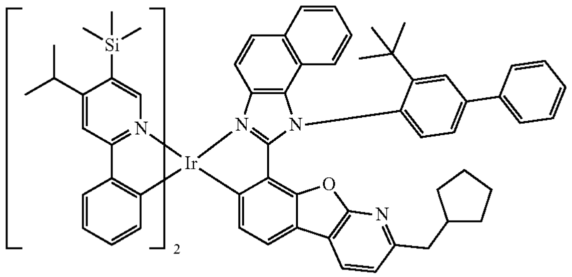

-continued
854
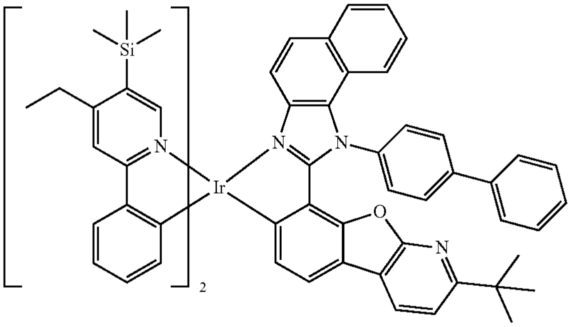
855
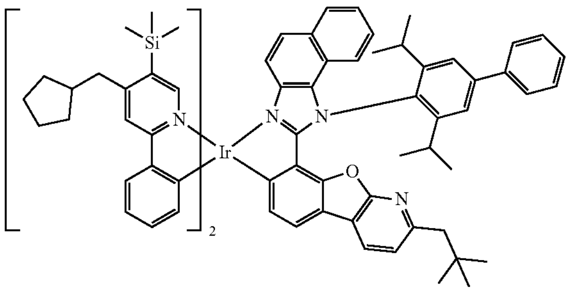
856
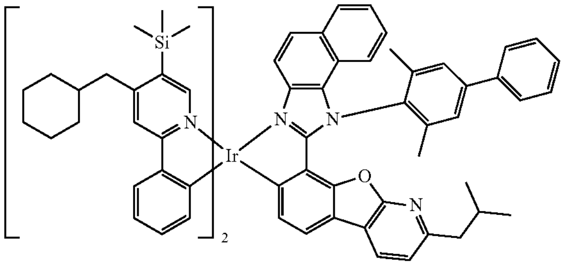
857
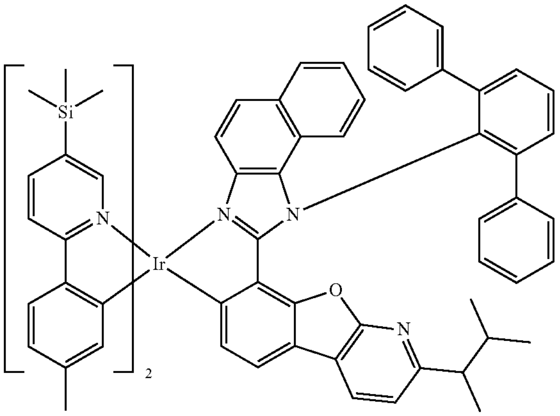
-continued
858
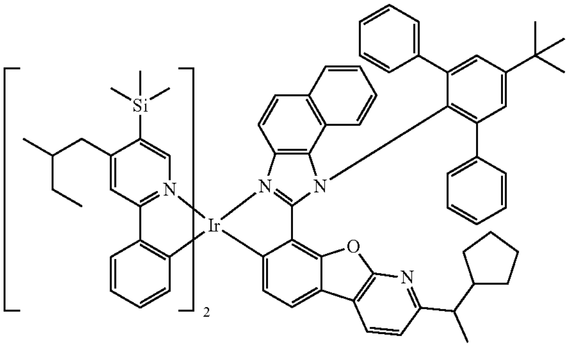
859
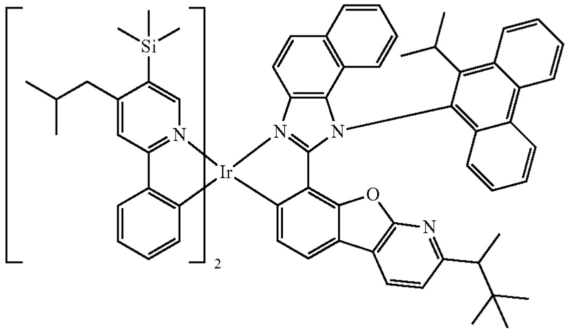
860
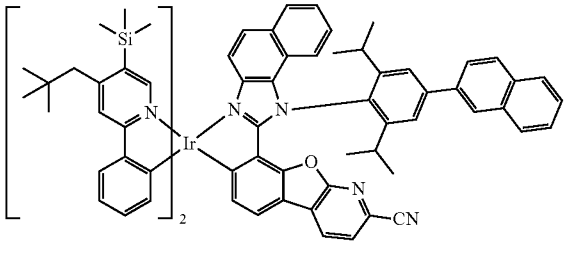
861
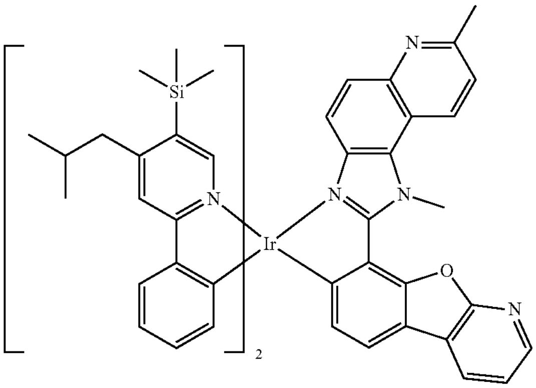

-continued
862
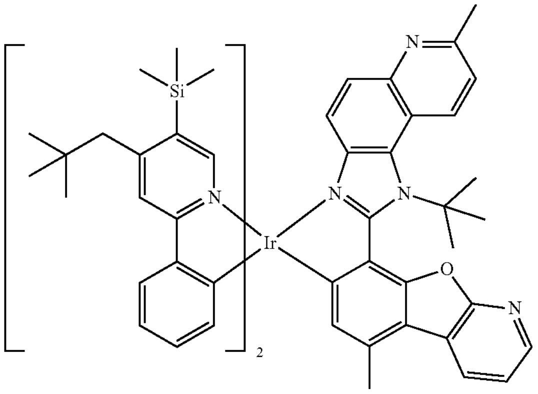
863
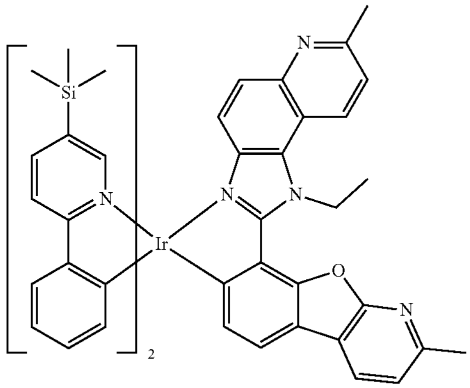
864
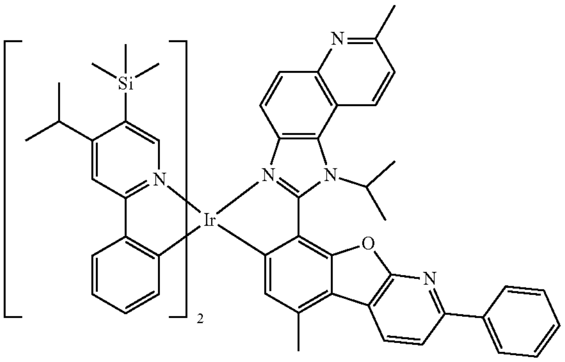
865
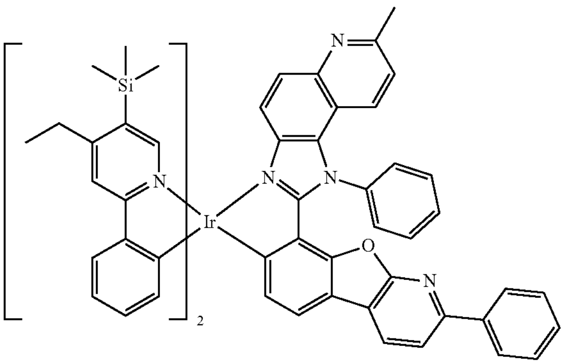
-continued
866
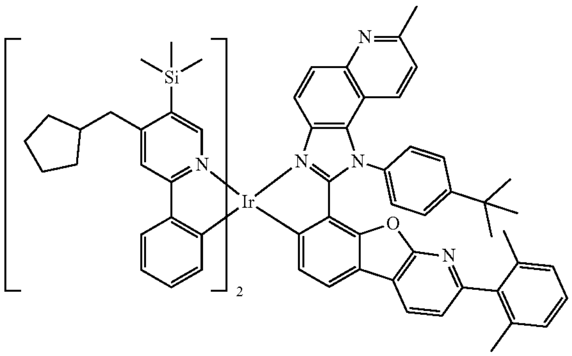
867
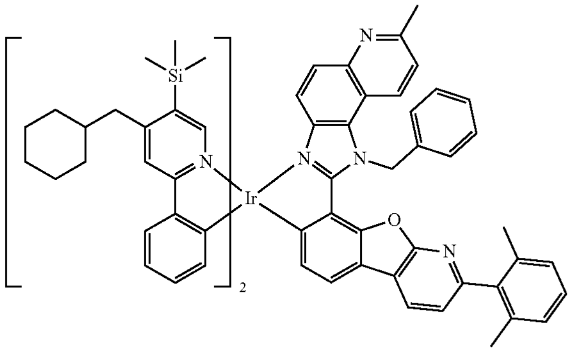
868
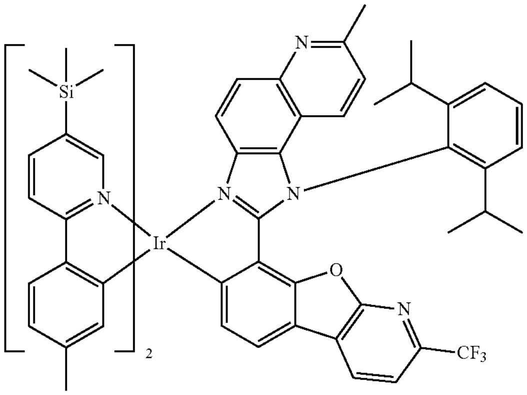
869
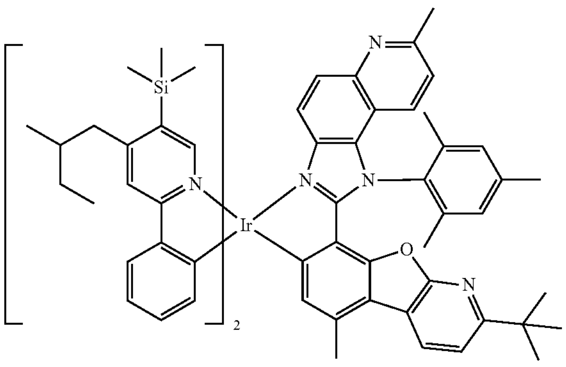

-continued
870
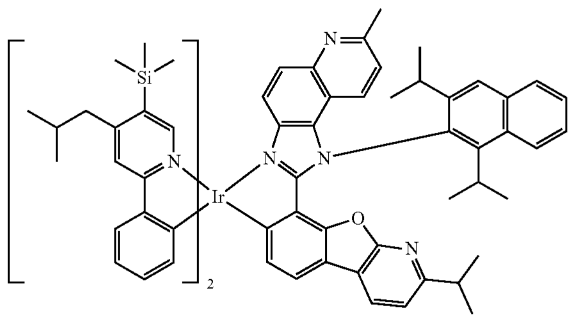
871
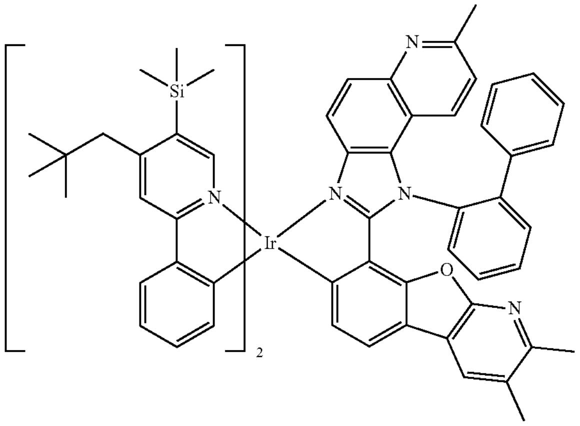
872
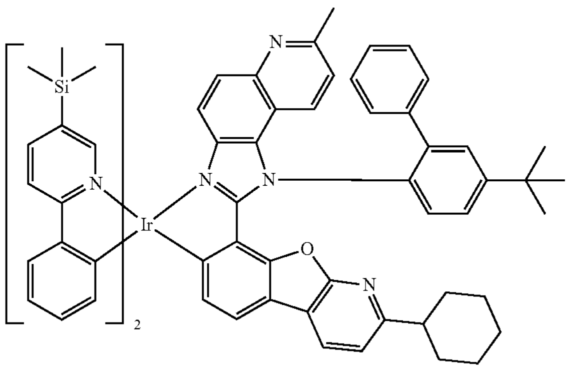
873
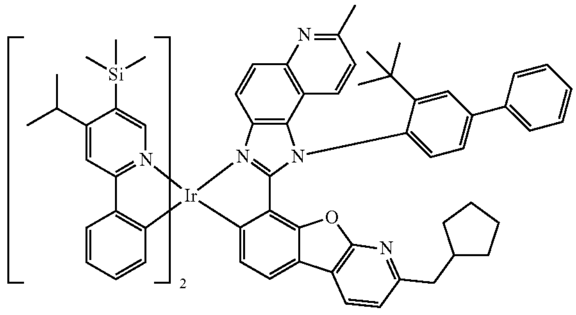
-continued
874
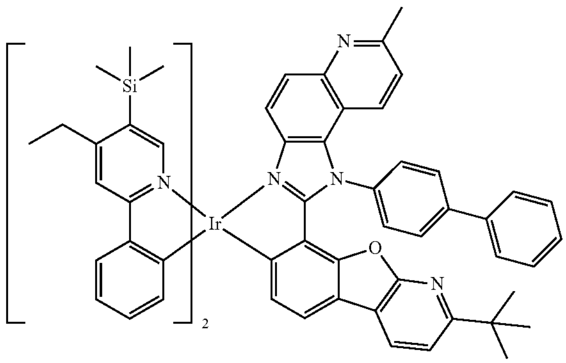
875
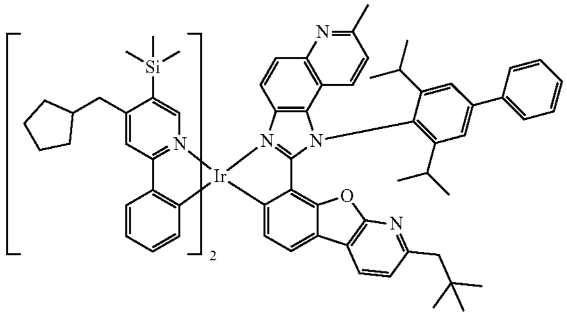
876
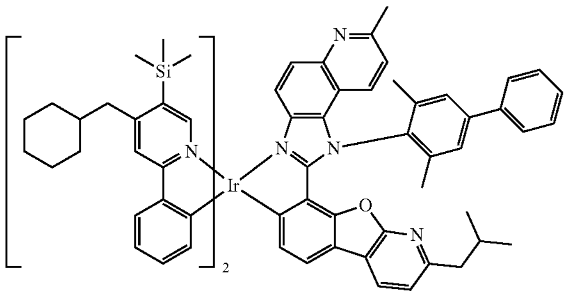
877
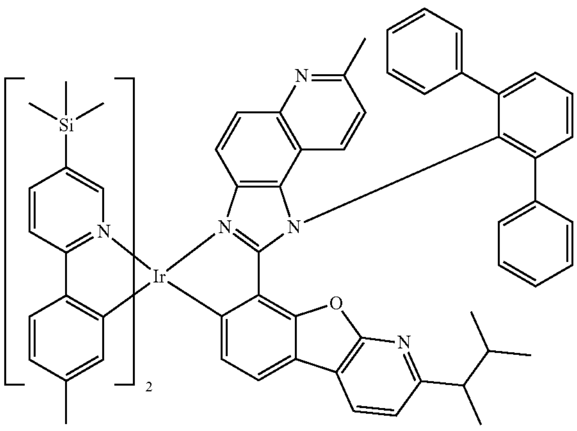

-continued
878
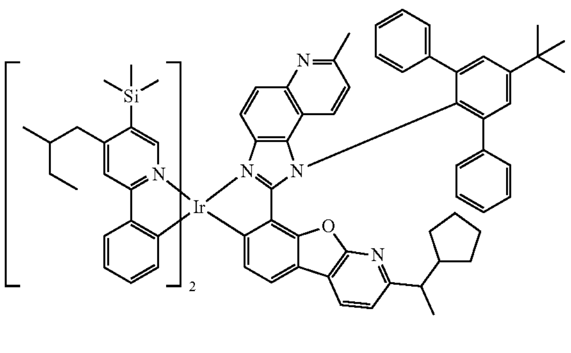
879
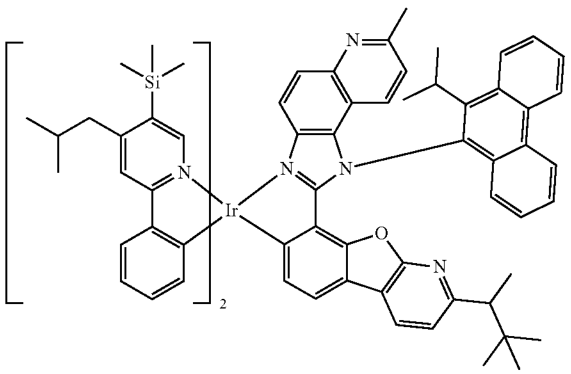
880
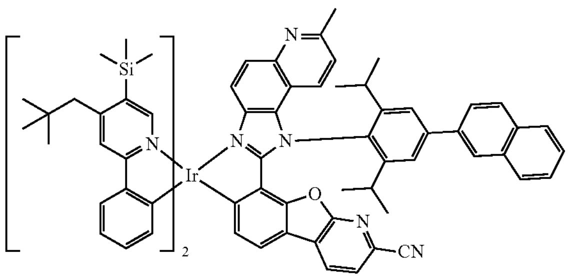
881
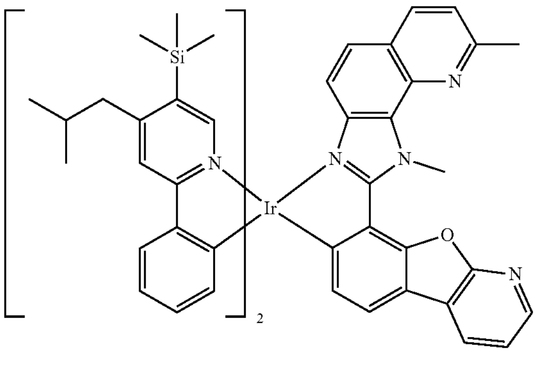
-continued
882
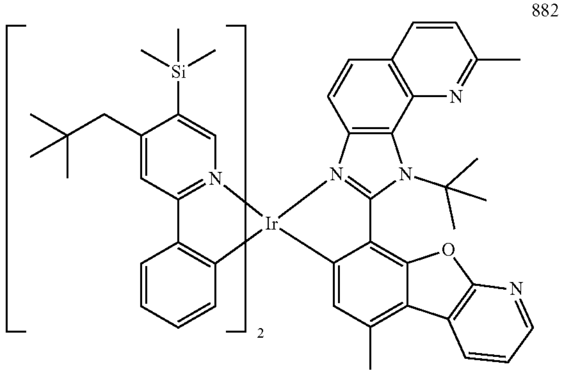
883
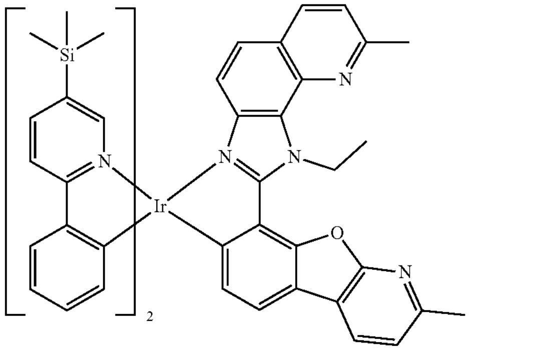
884
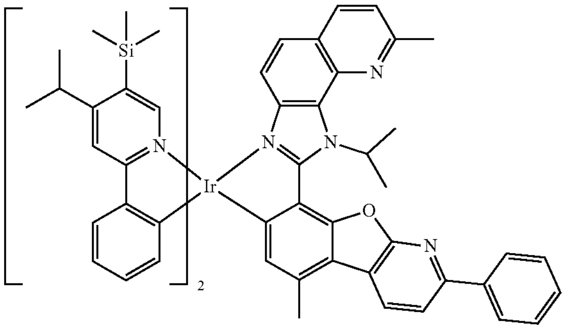
885
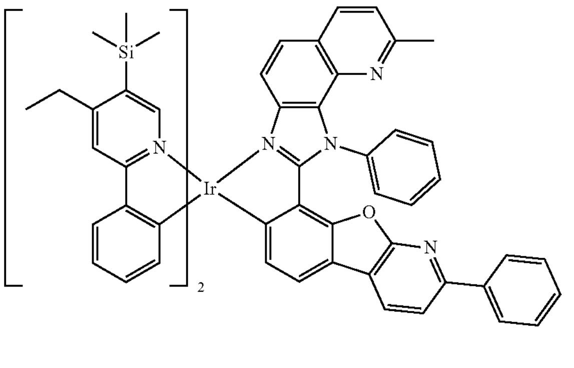

-continued
886
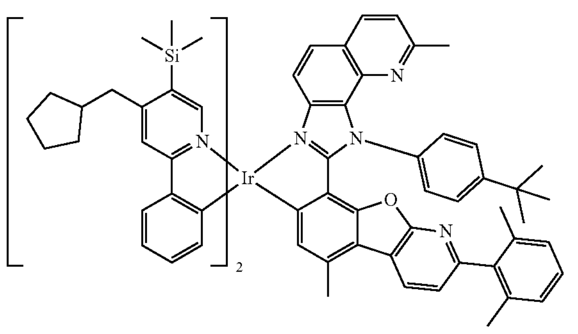
887
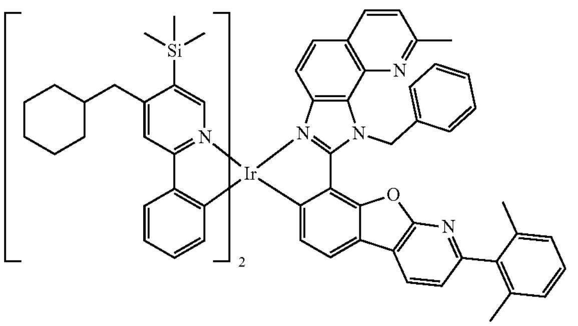
888
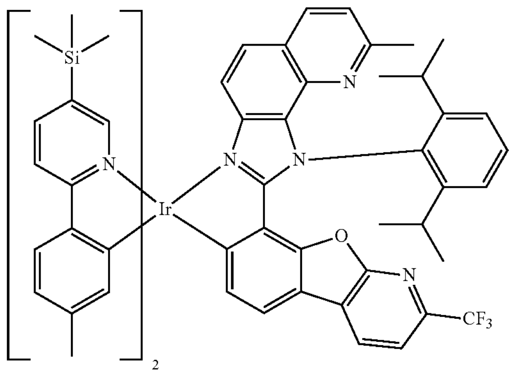
889
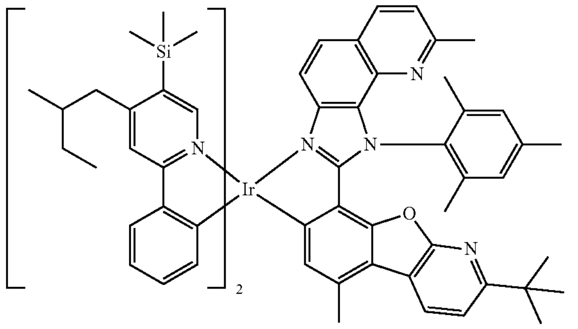
-continued
890
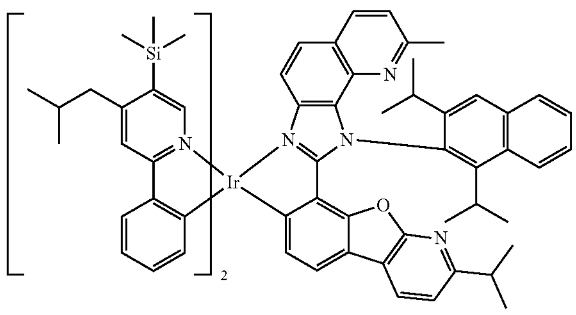
891
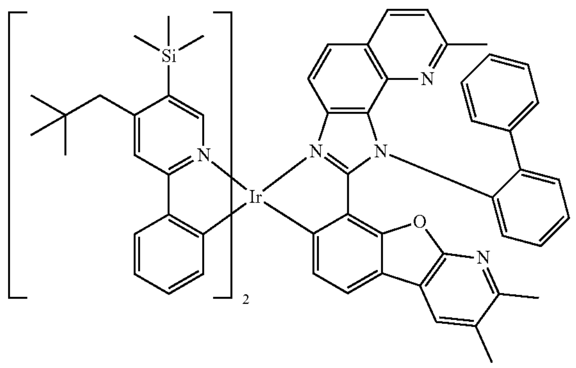
892
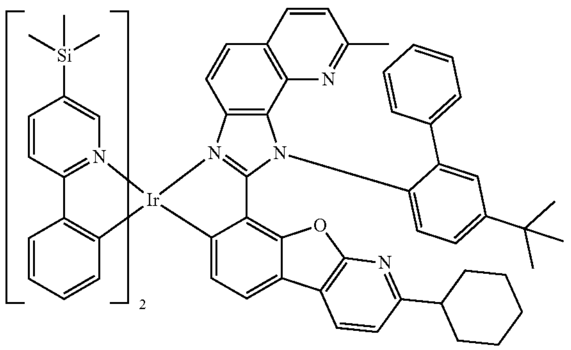
893
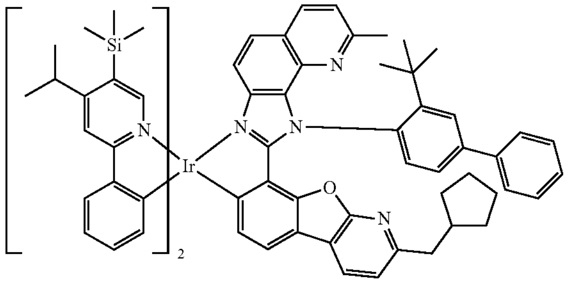

-continued
894
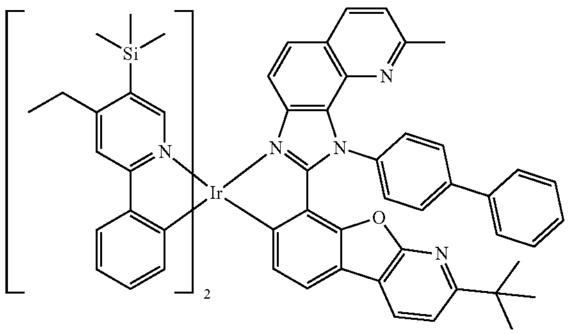
895
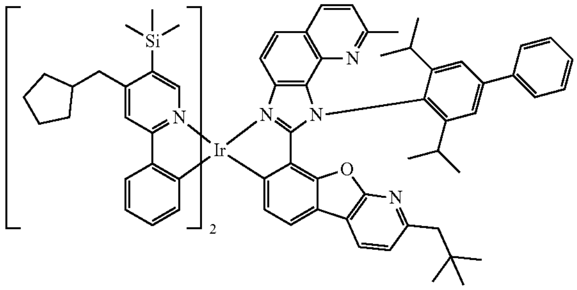
896
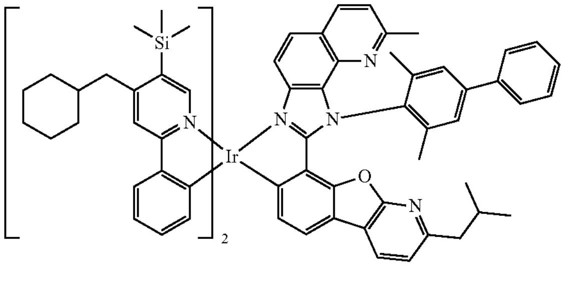
897
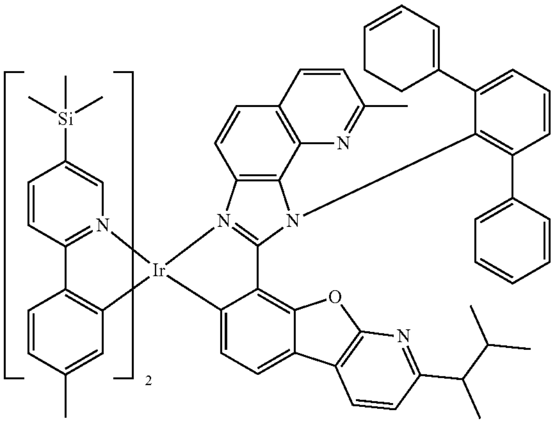
898
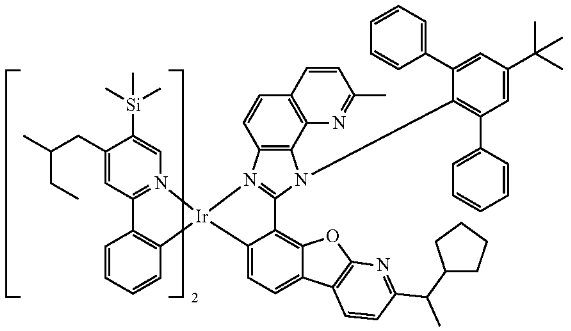
899
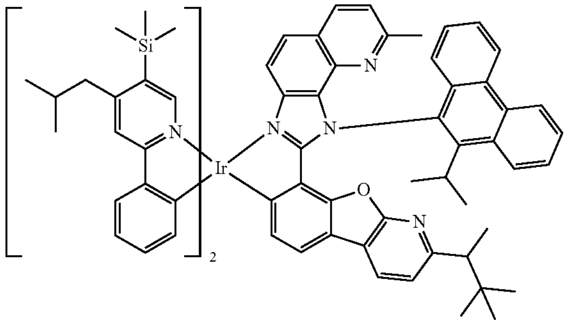
900
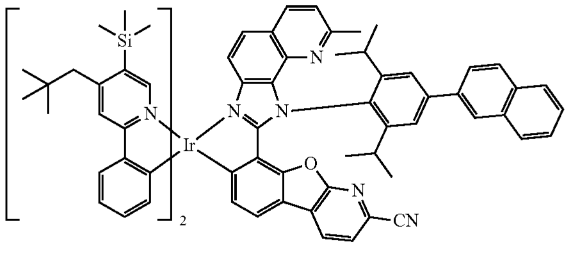
901
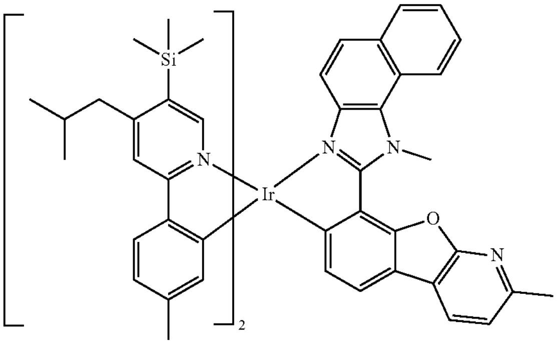

-continued
902
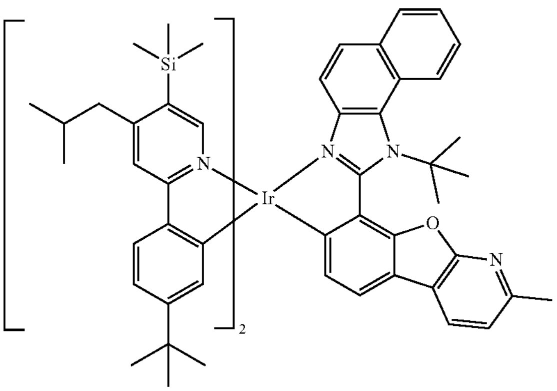
903
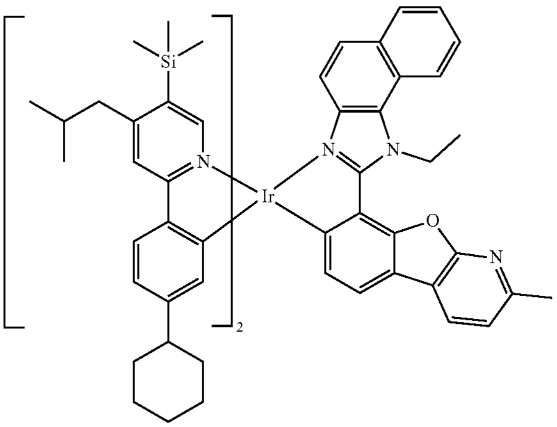
904
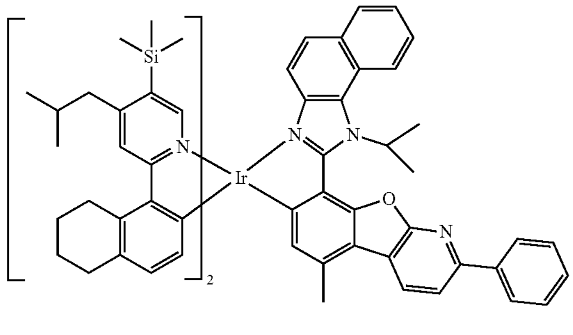
905
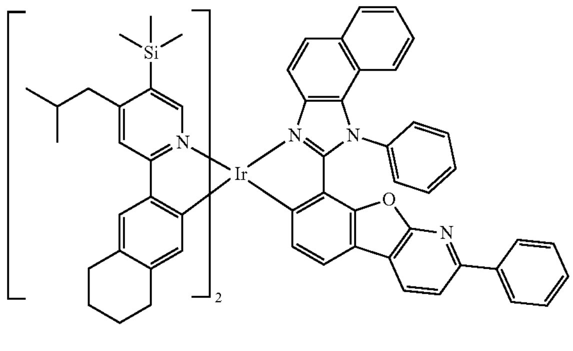
906
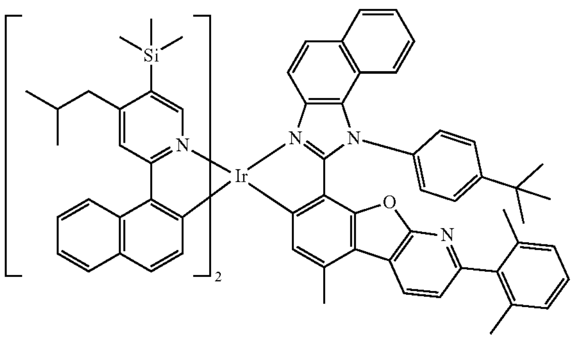
907
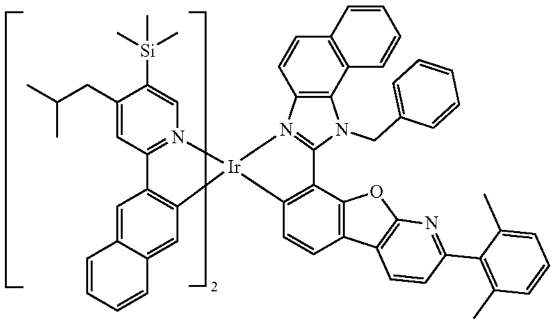
908
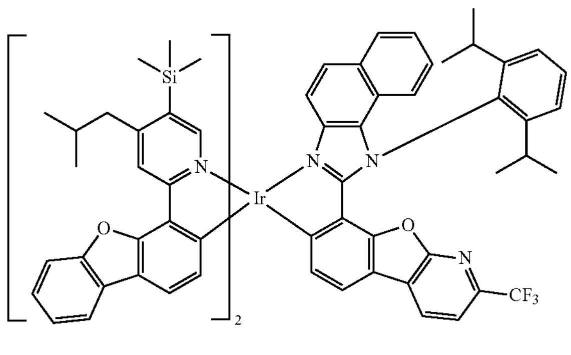
909
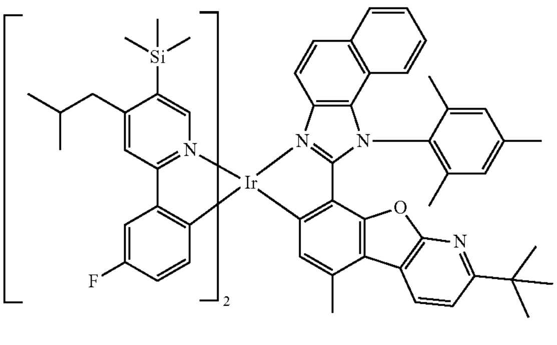

-continued
910
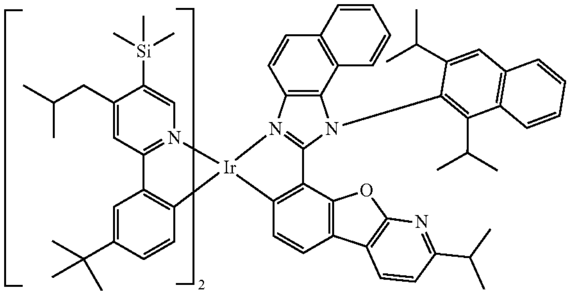
911
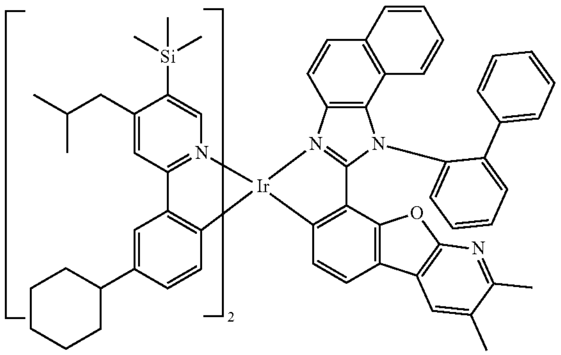
912
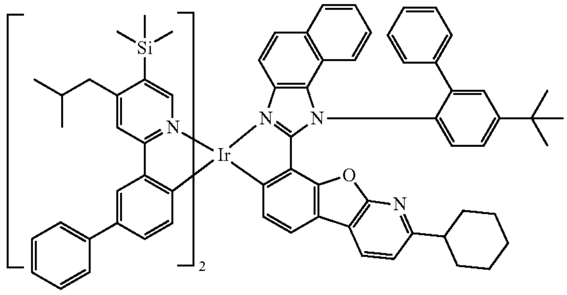
913
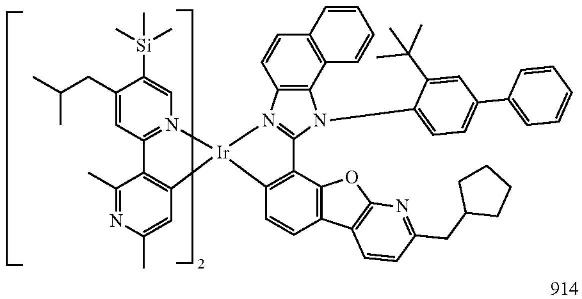
914
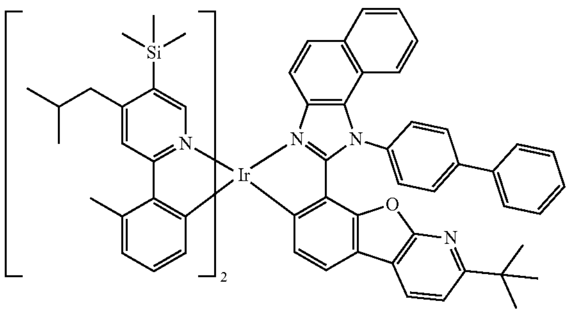
-continued
915
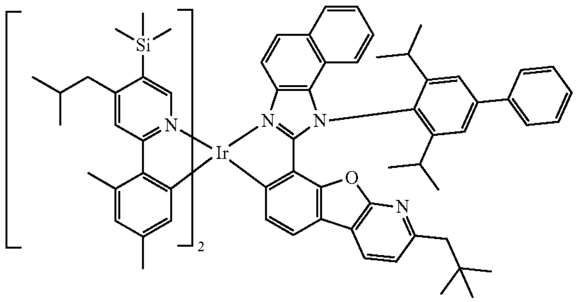
916
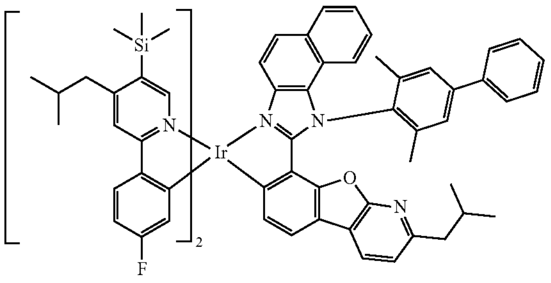
917
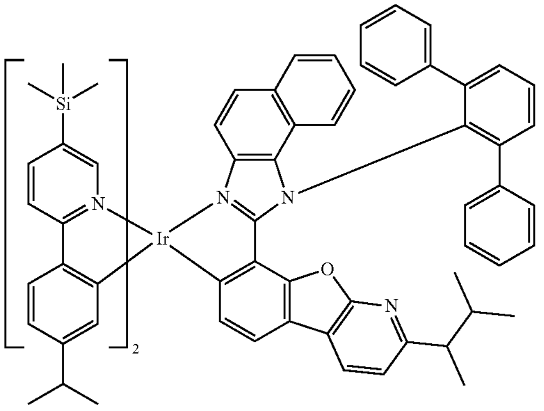
918
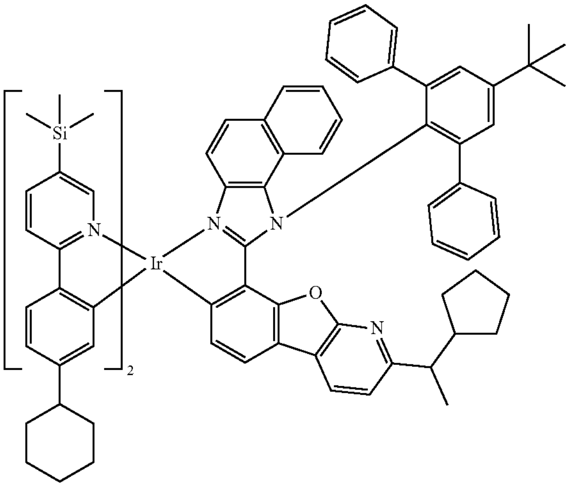

-continued
919
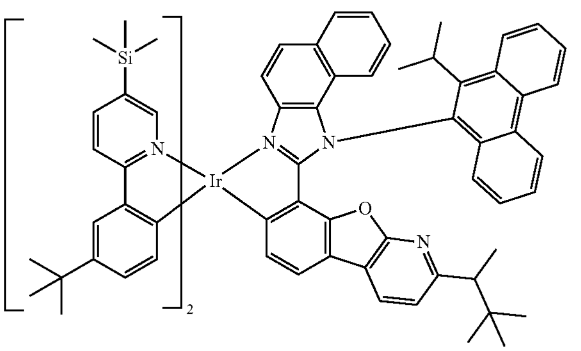
920
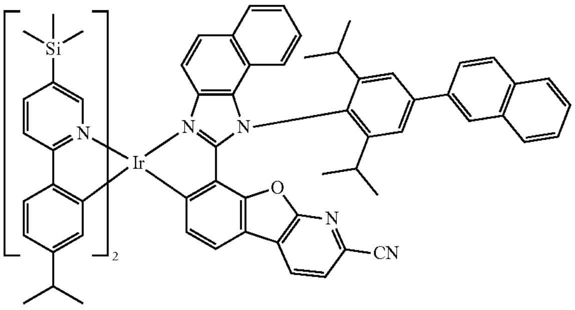
921
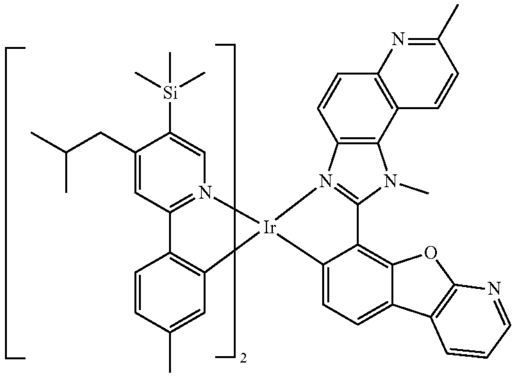
922
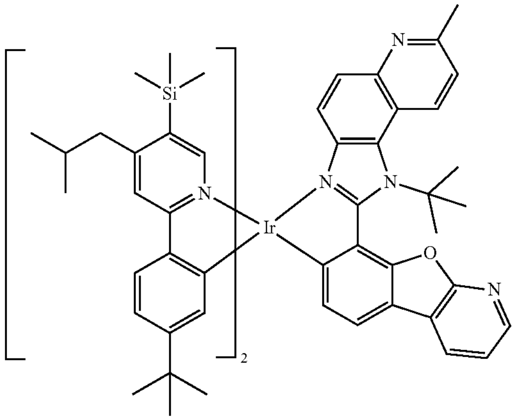
-continued
923
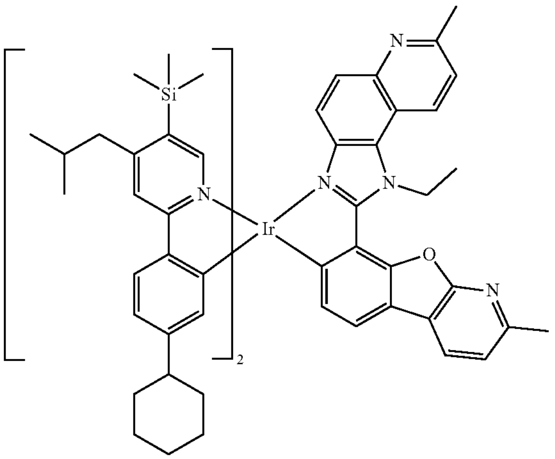
924
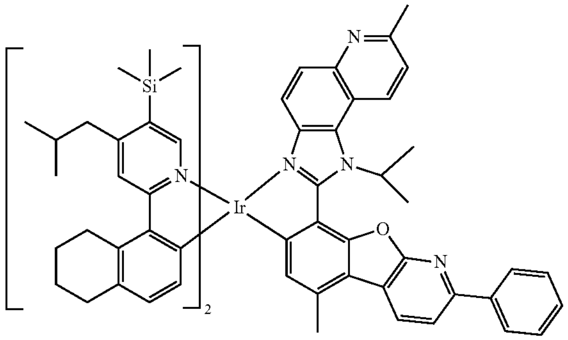
925
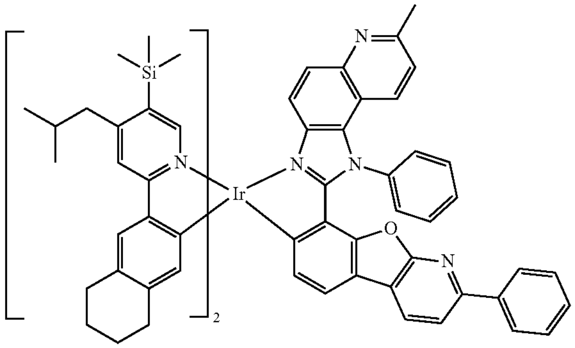
926
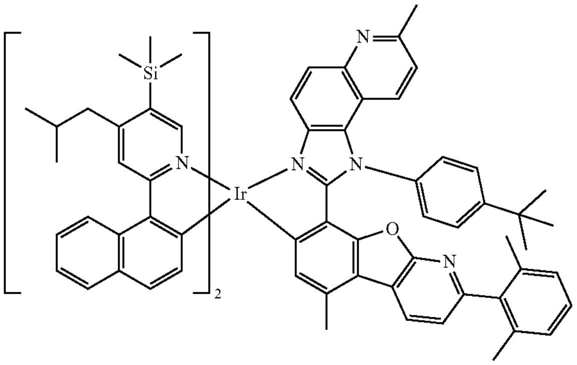

-continued
927
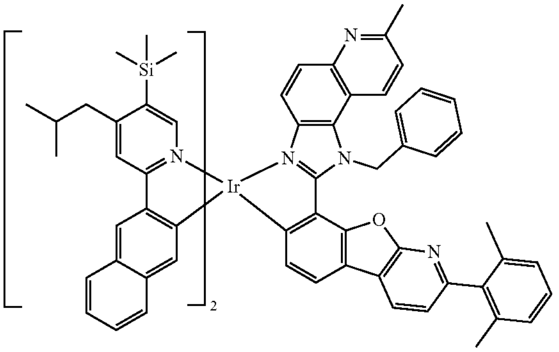
928
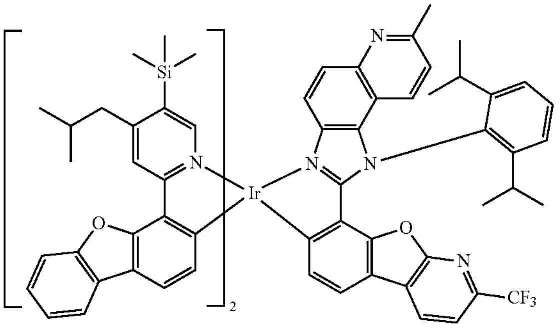
929
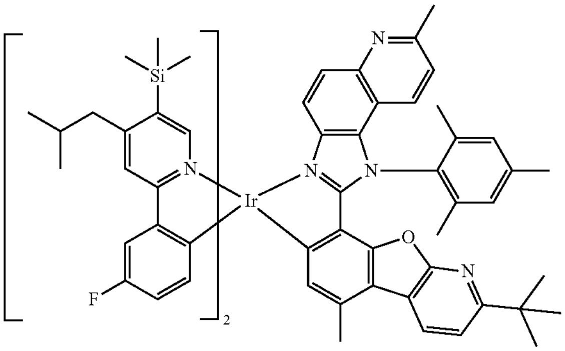
930
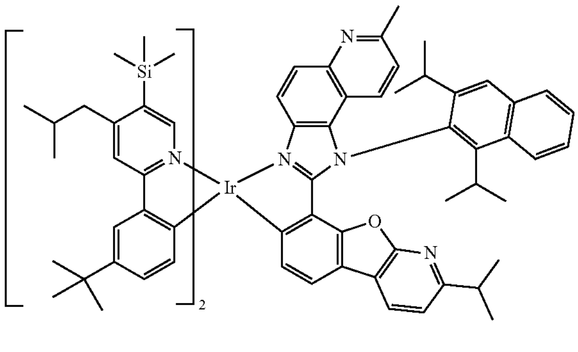
-continued
931
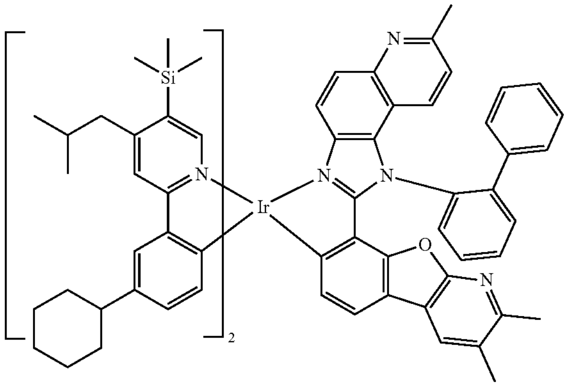
932
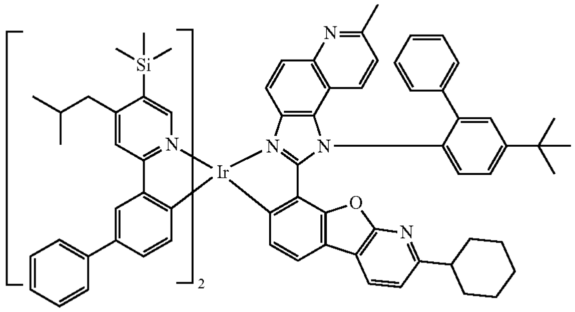
933
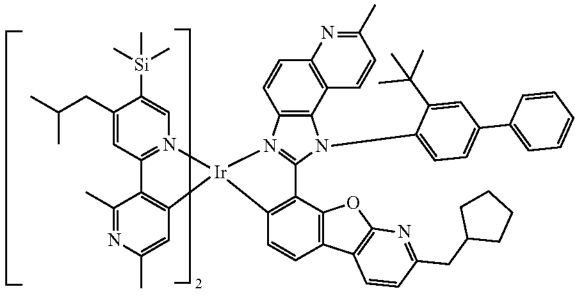
934
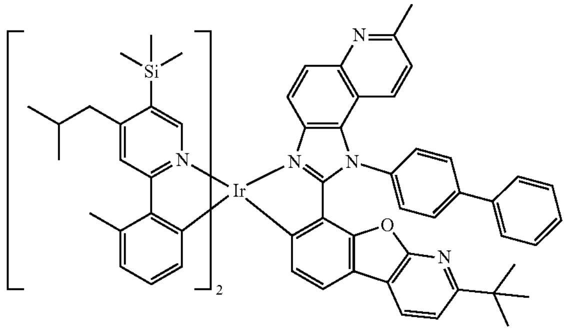

-continued
935
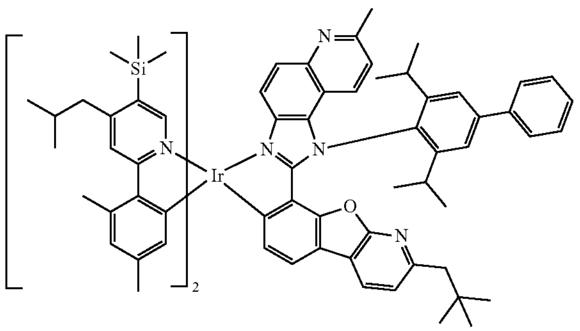
936
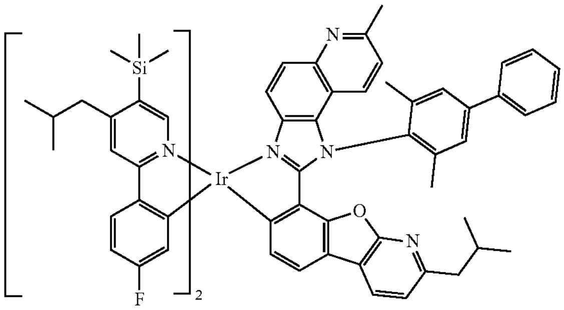
937
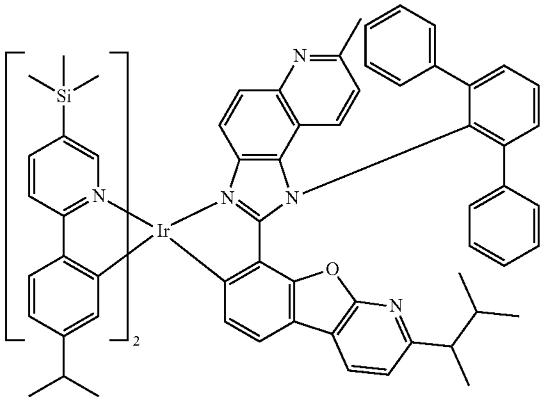
938
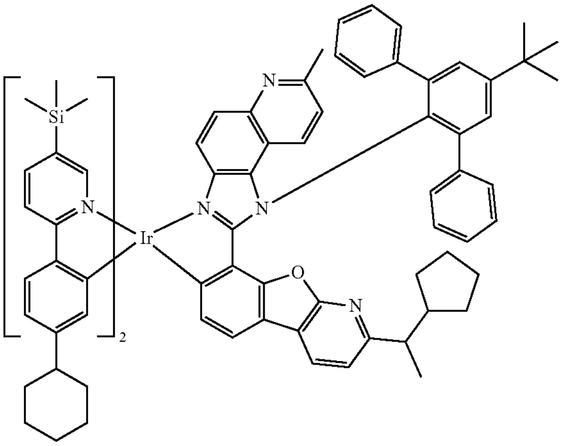
-continued
939
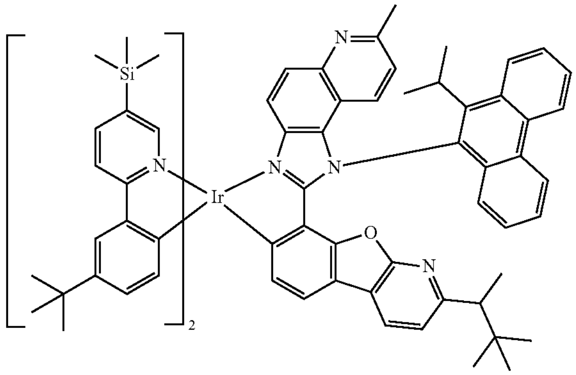
940
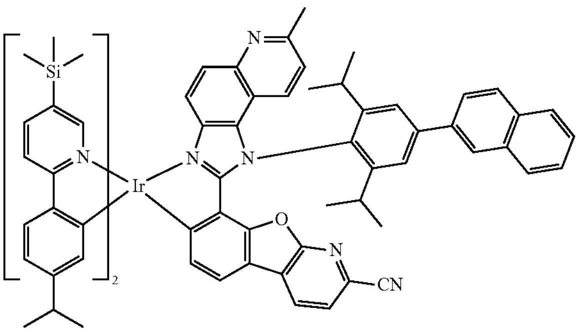
941
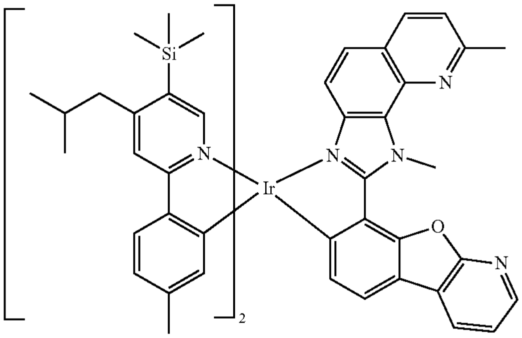
942
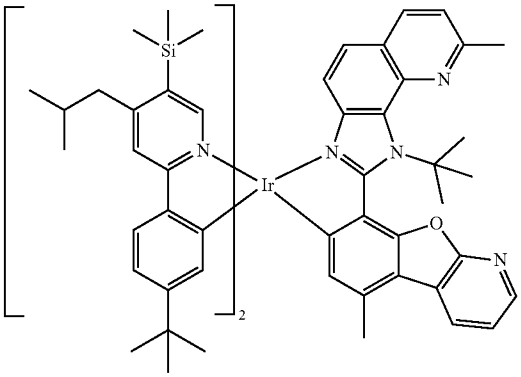

-continued
943
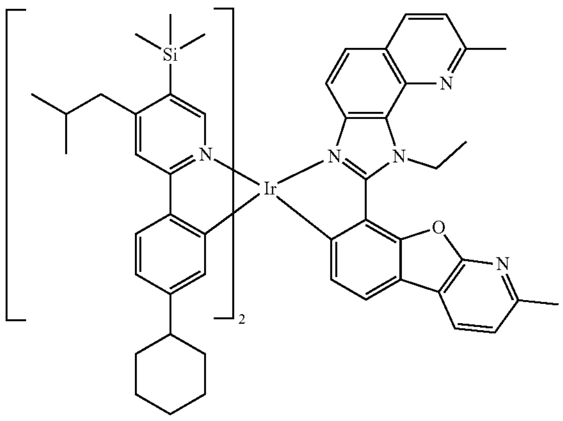
944
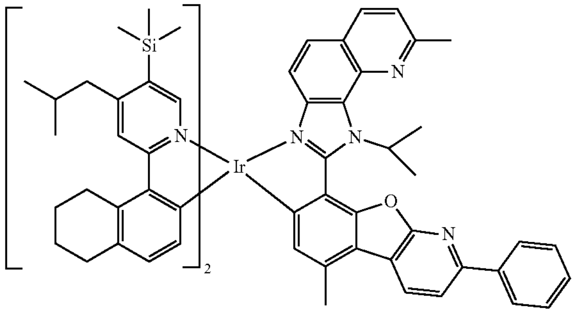
945
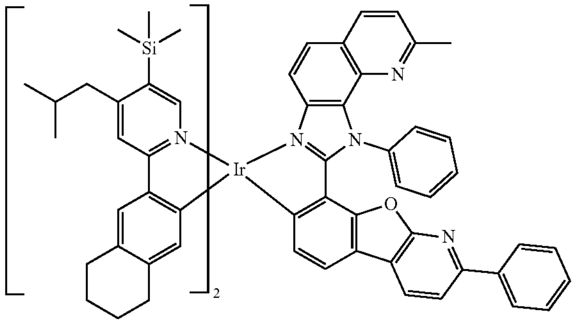
946
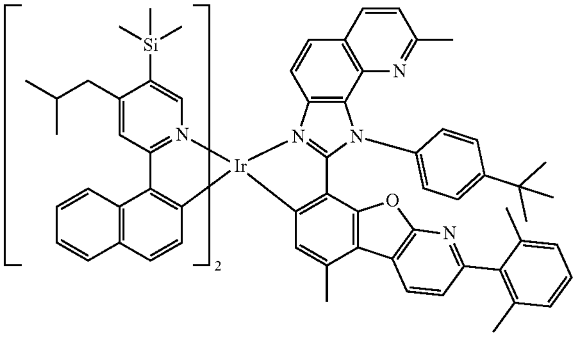
-continued
947
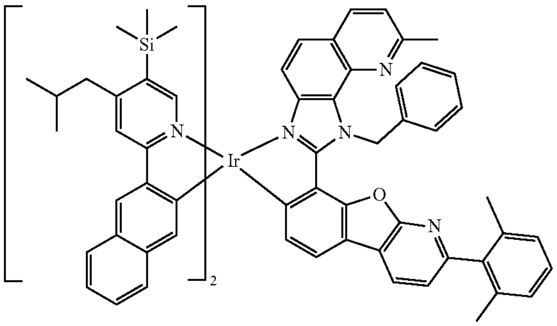
948
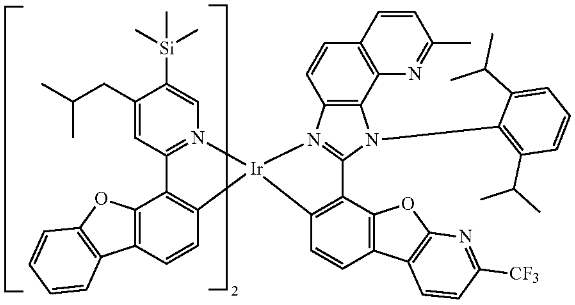
949
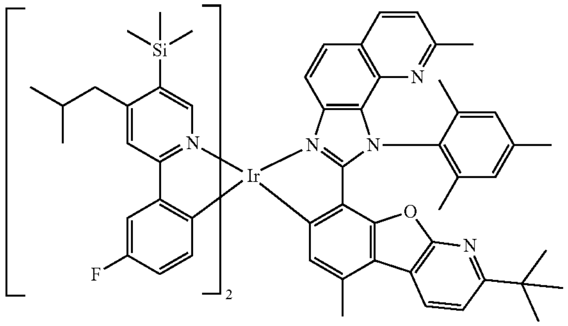
950
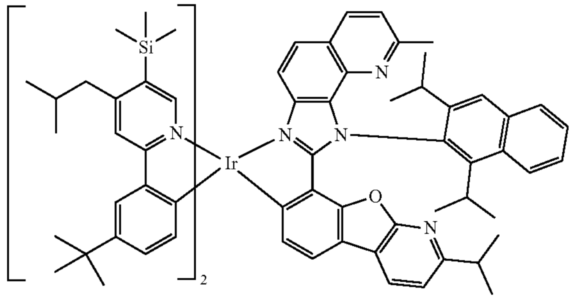

-continued
951
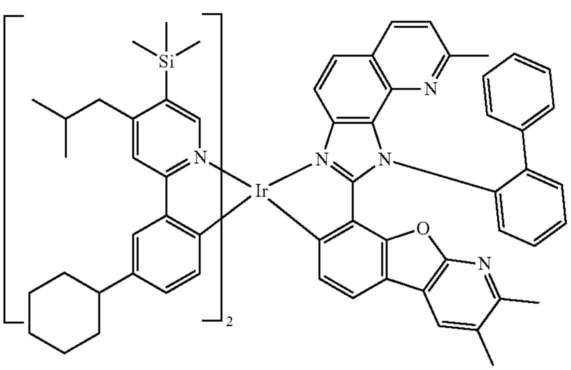
952
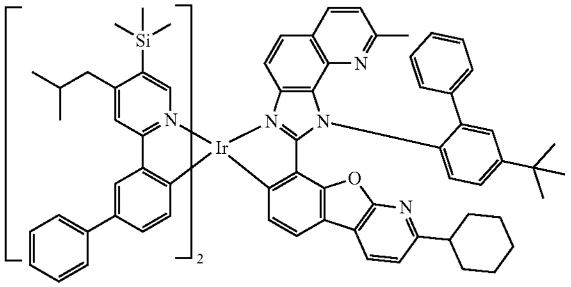
953
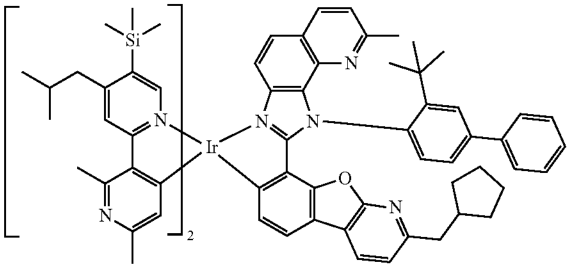
954
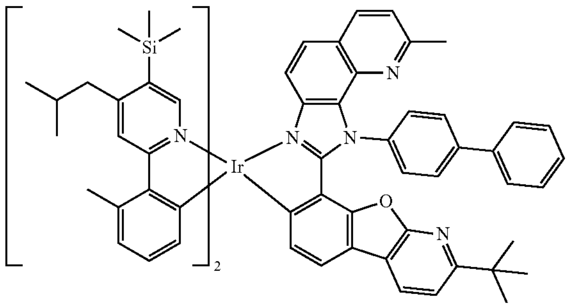
955
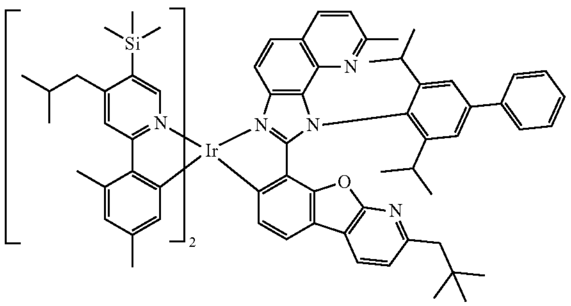
-continued
956
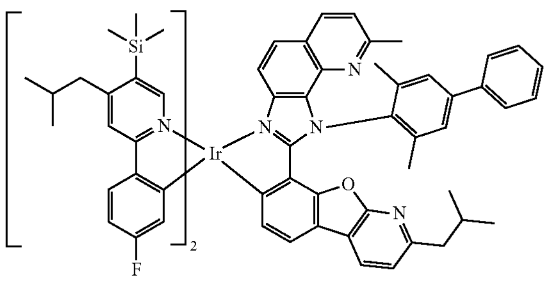
957
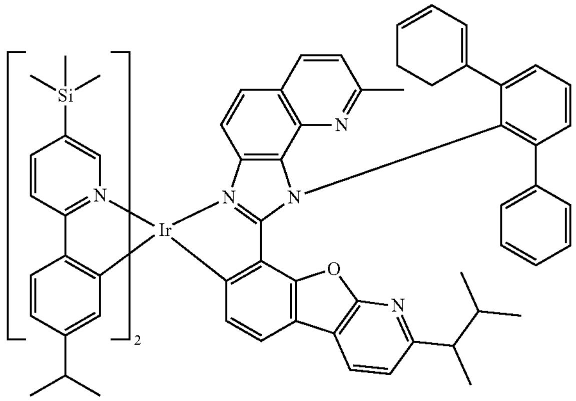
958
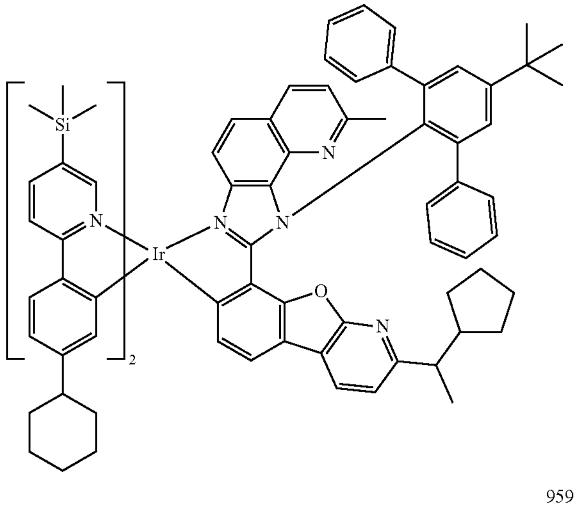
959
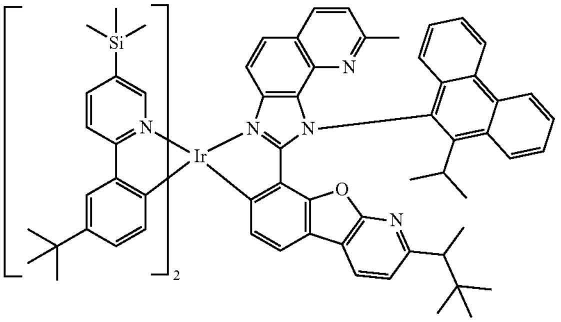

-continued
960
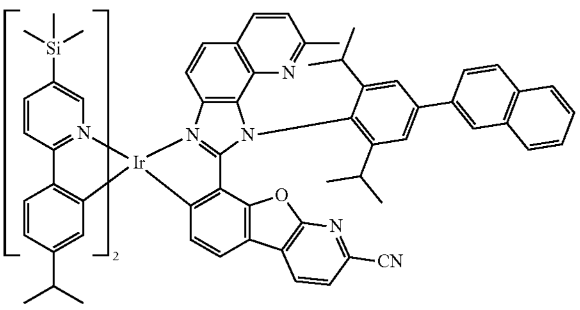
961
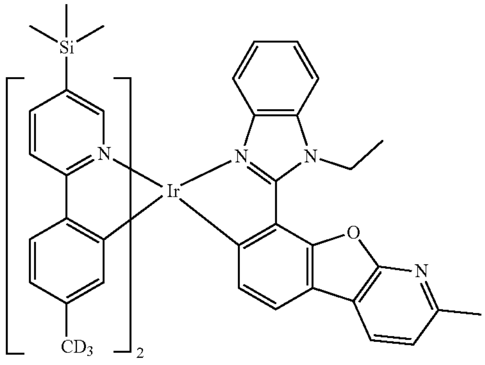
962
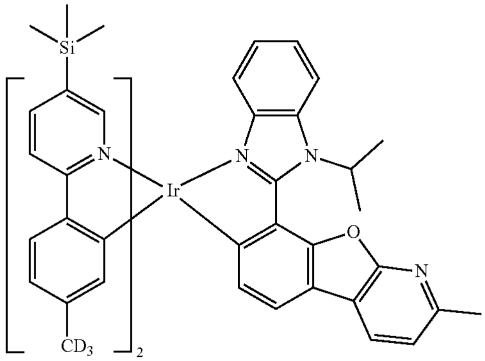
963
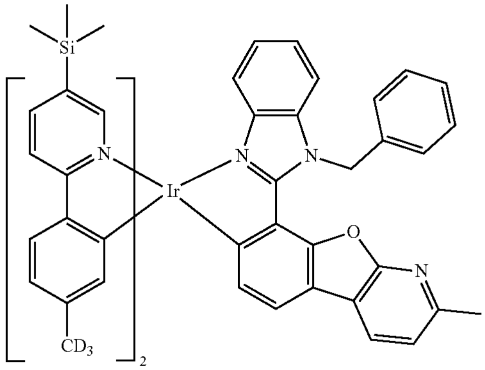
-continued
964
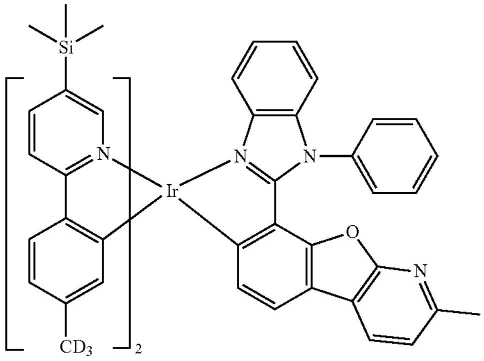
965
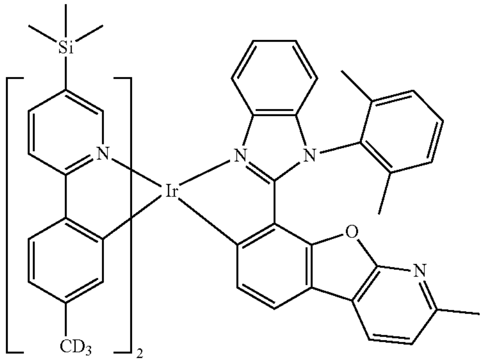
966
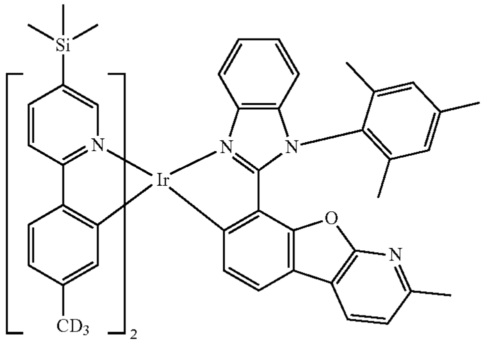
967
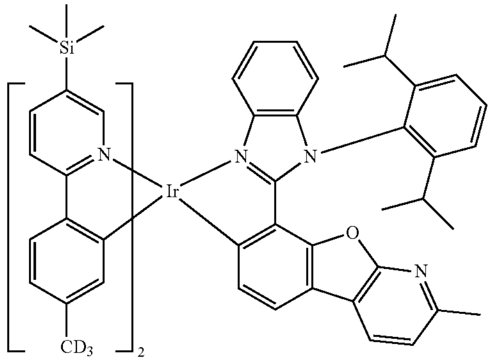

-continued
968
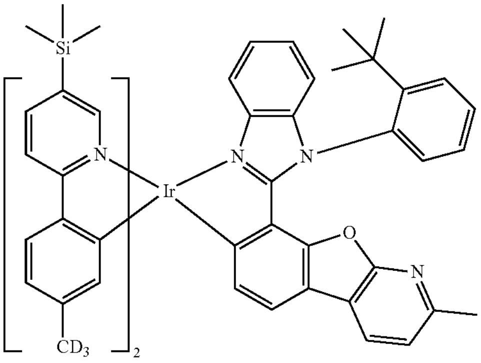
969
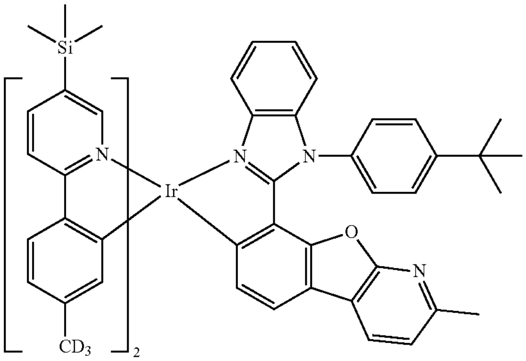
970
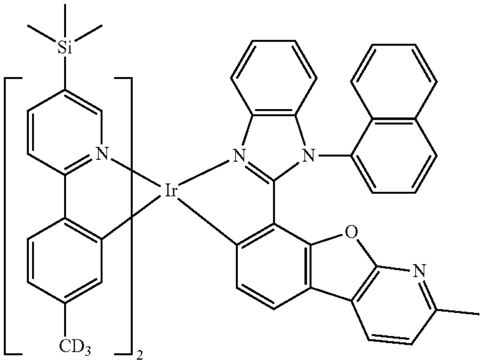
971
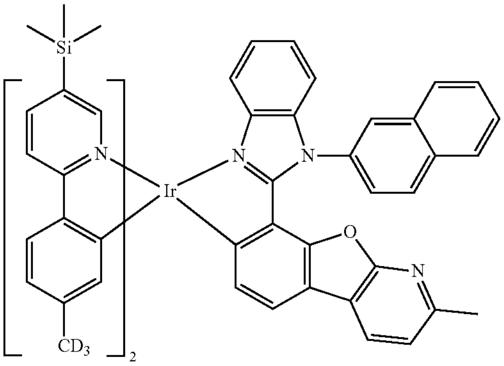
-continued
972
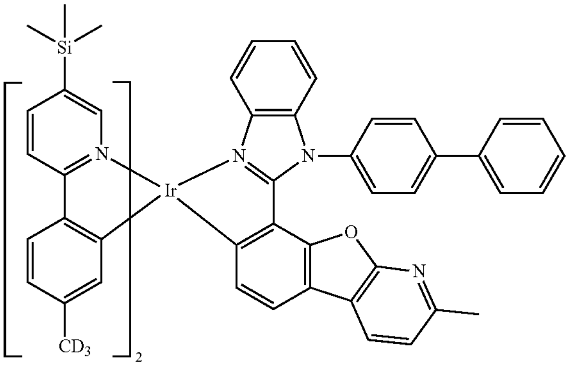
973
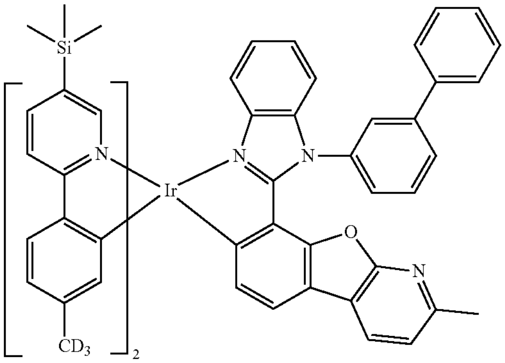
974
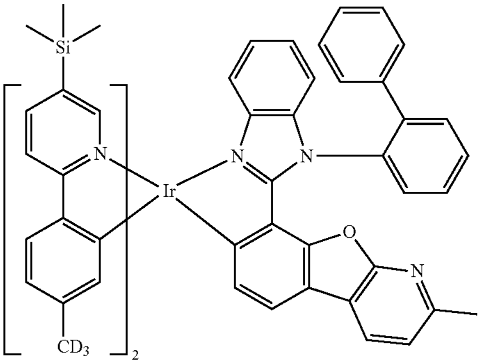
975
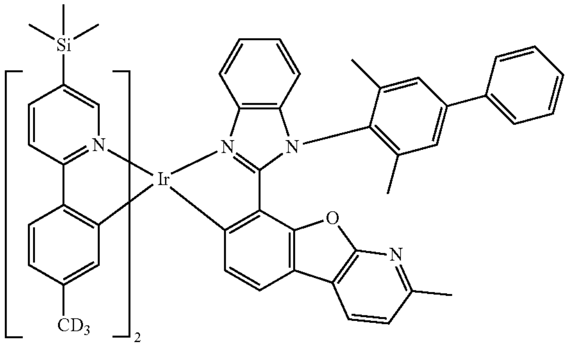

-continued
976
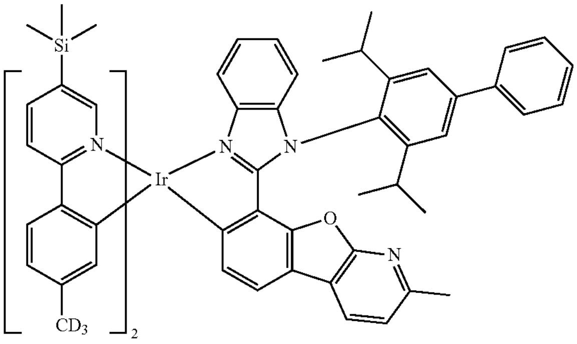
977
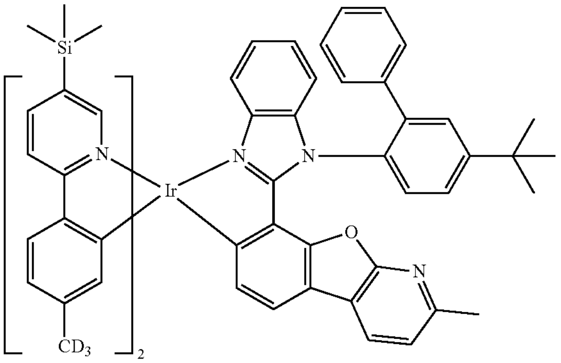
978
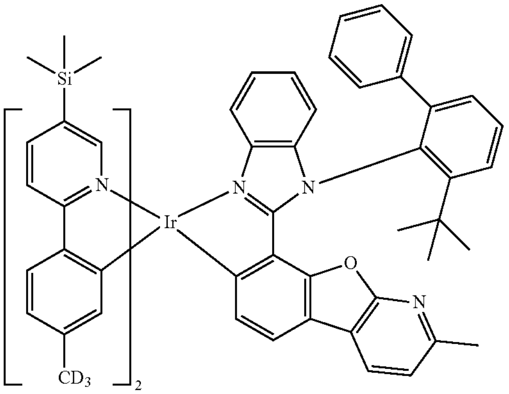
979
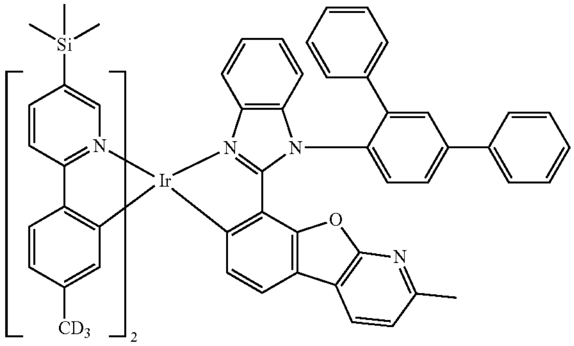
-continued
980
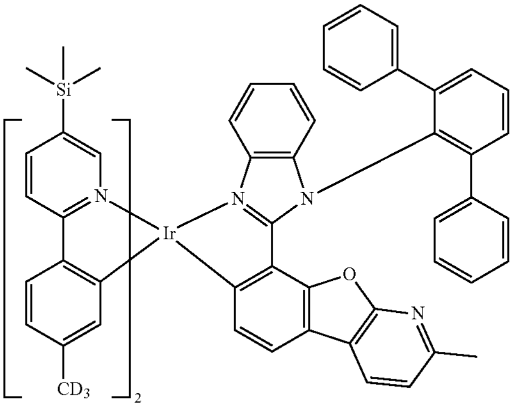
981
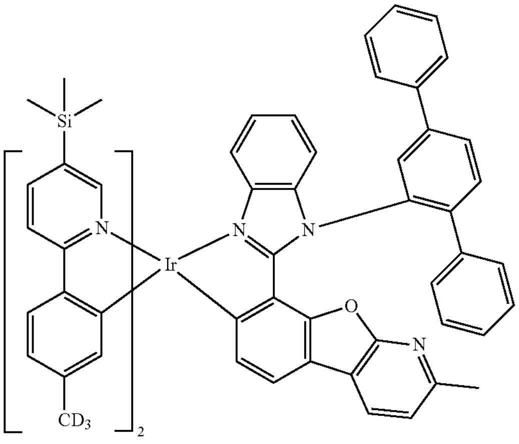
982
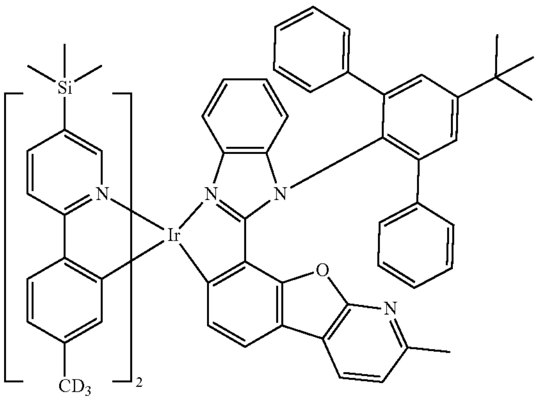

-continued
983
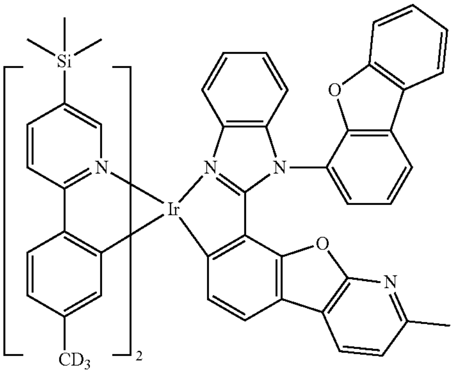
984
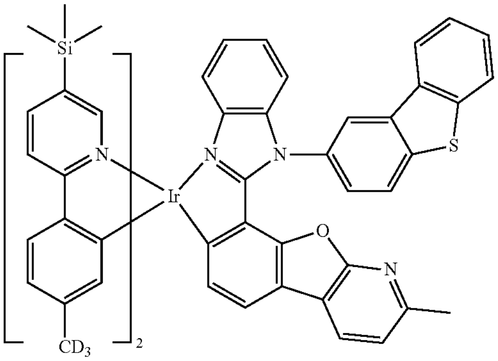
985
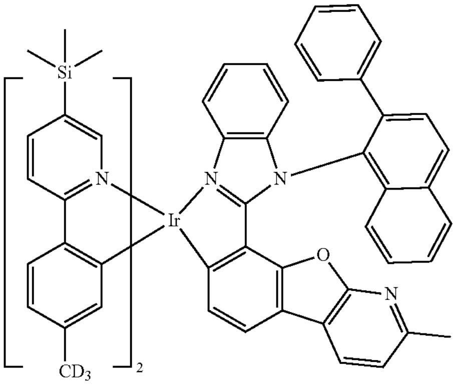
986
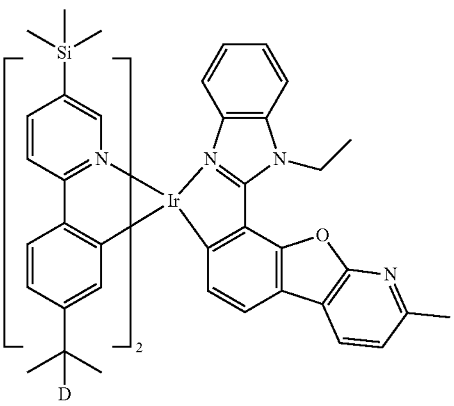
-continued
987
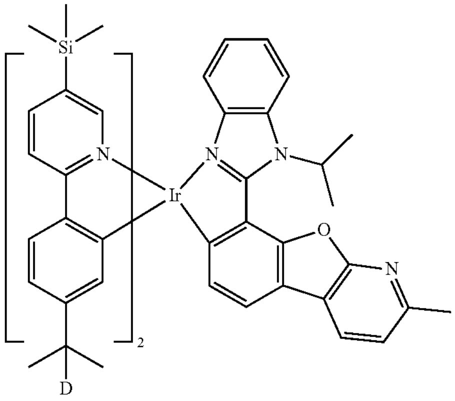
988
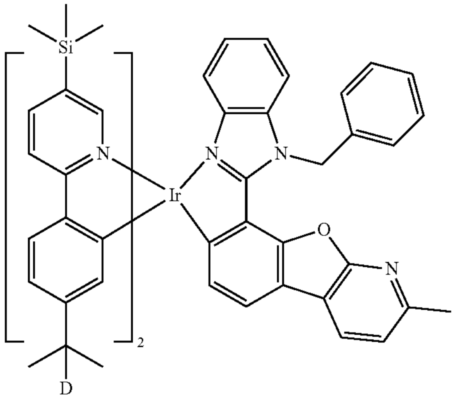
989
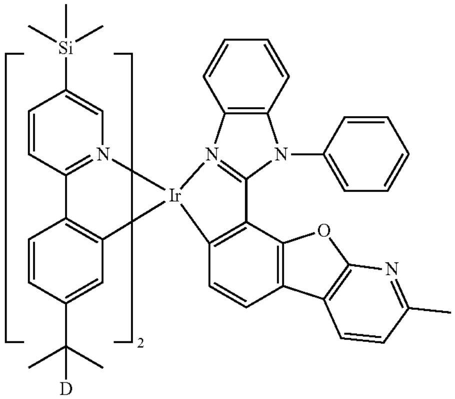
990
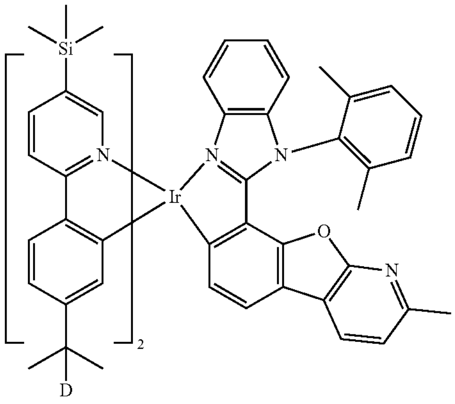

-continued
991
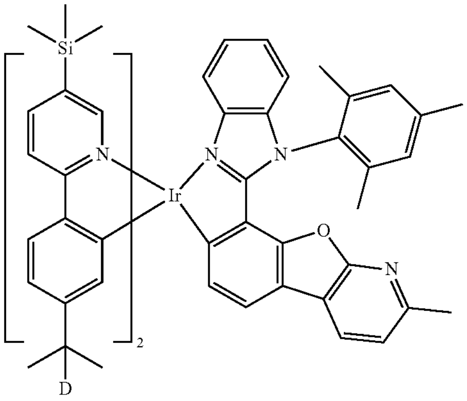
992
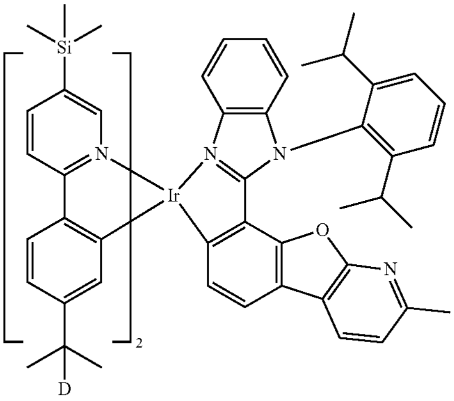
993
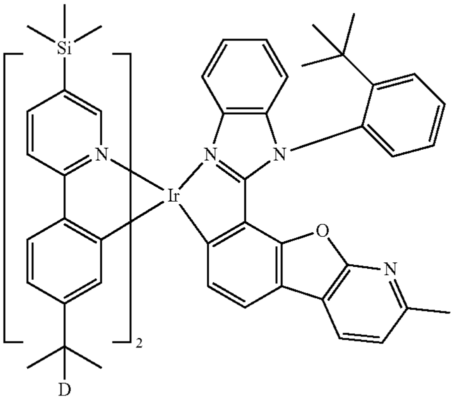
994
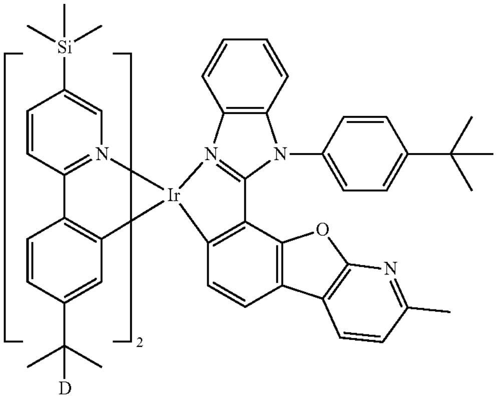
-continued
995
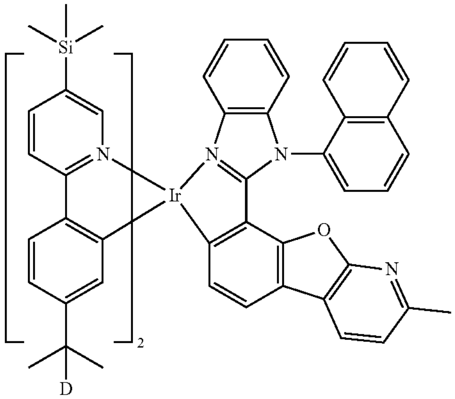
996
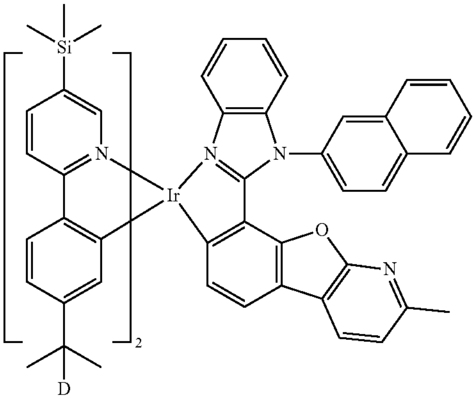
997
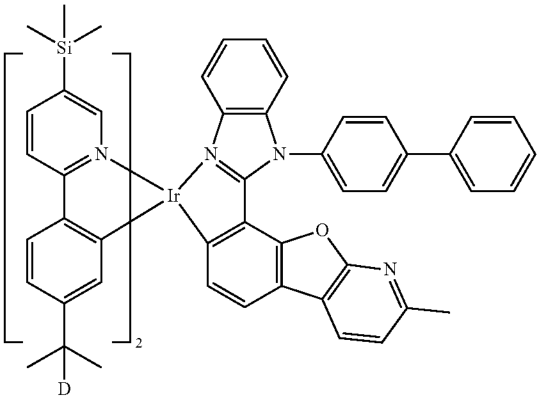
998
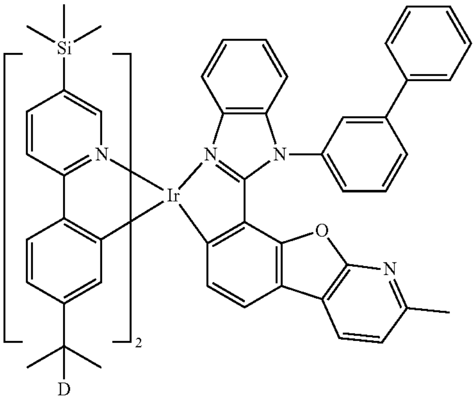

-continued
999
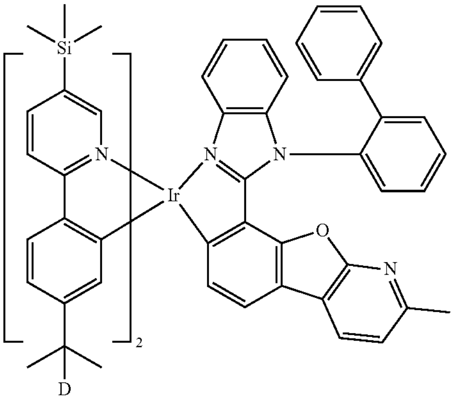
1000
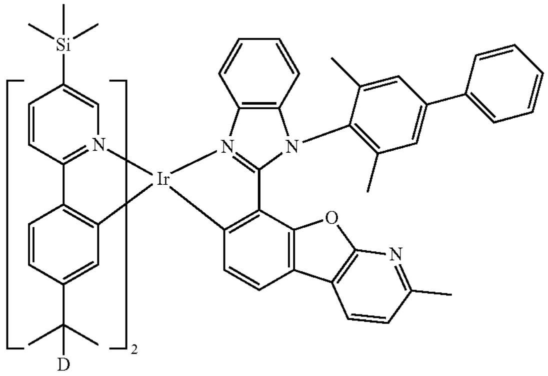
1001
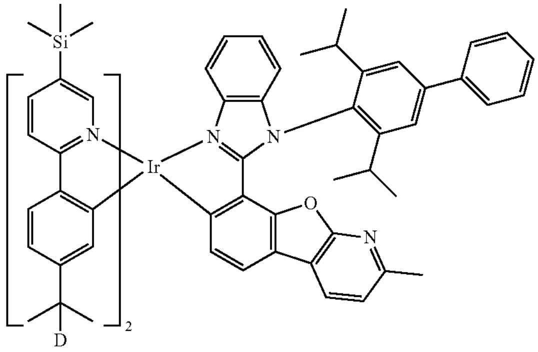
-continued
1002
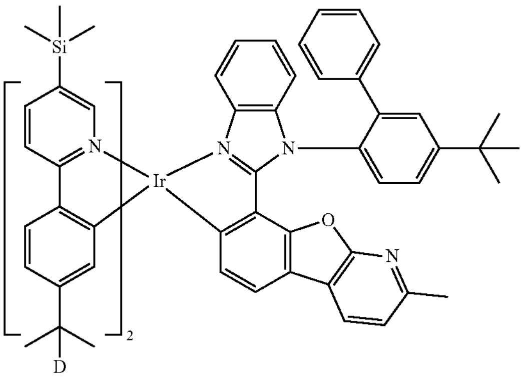
1003
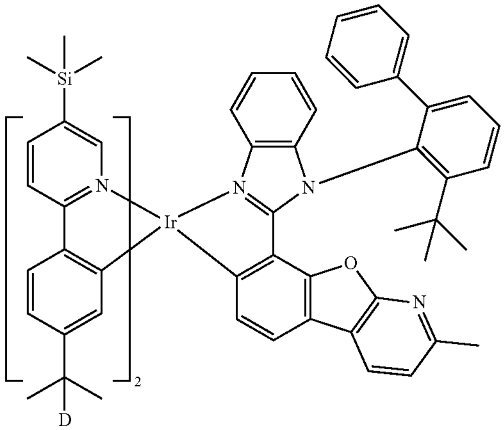
1004
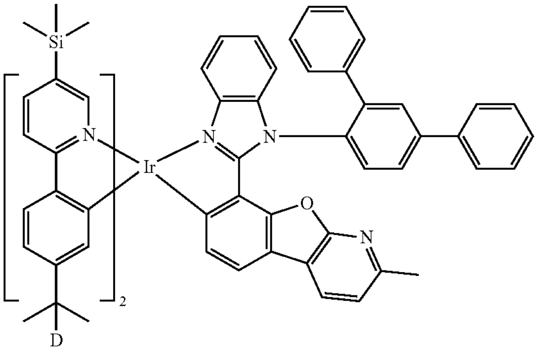

-continued
1005
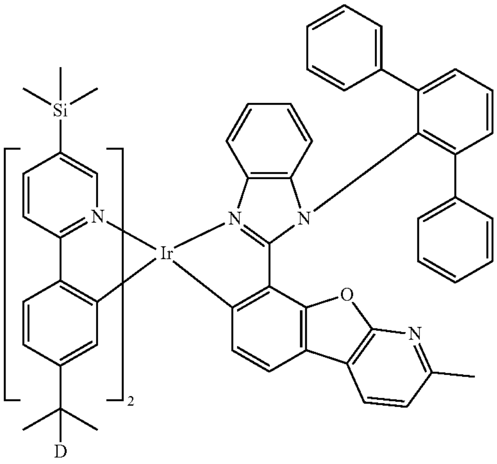
1006
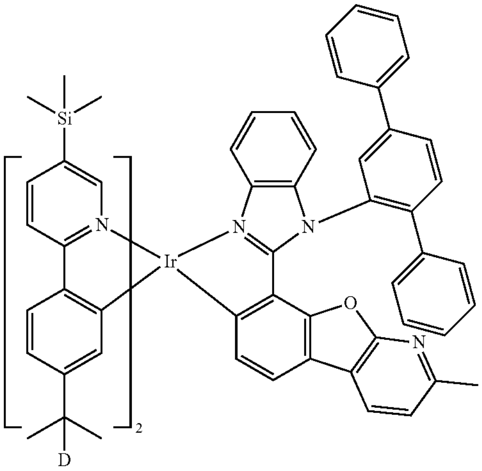
1007
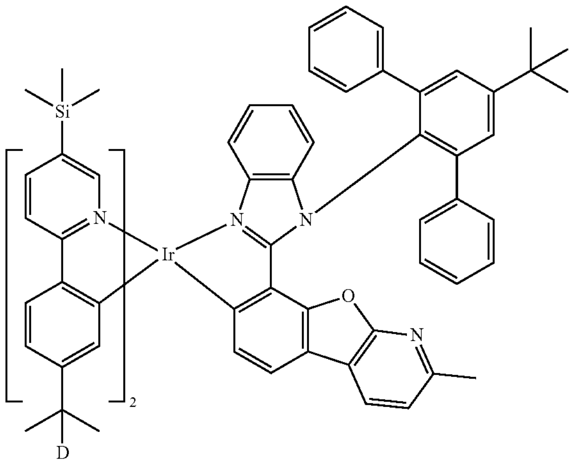
-continued
1008
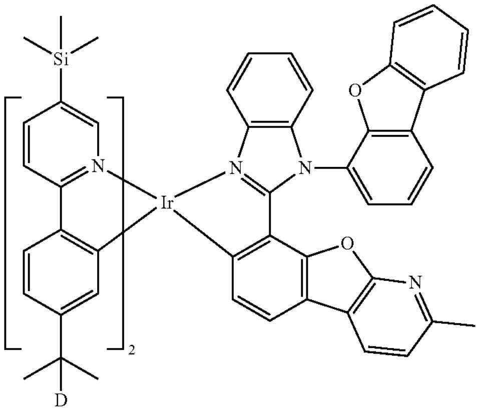
1009
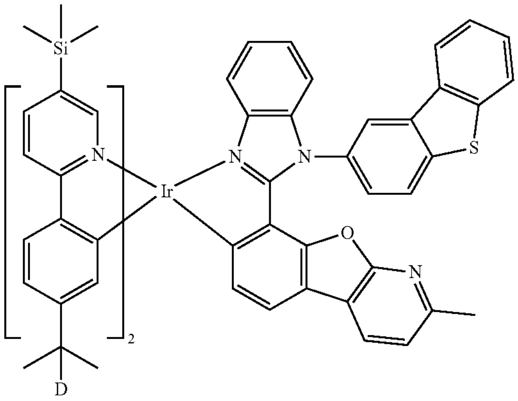
1010
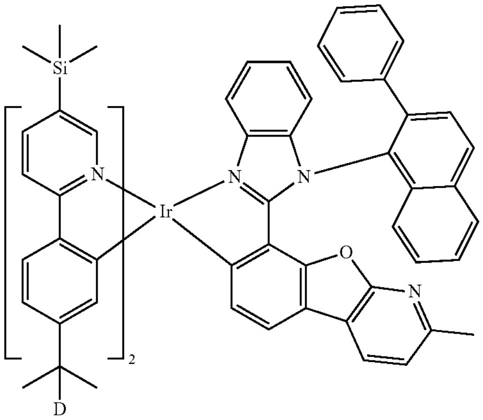
1011
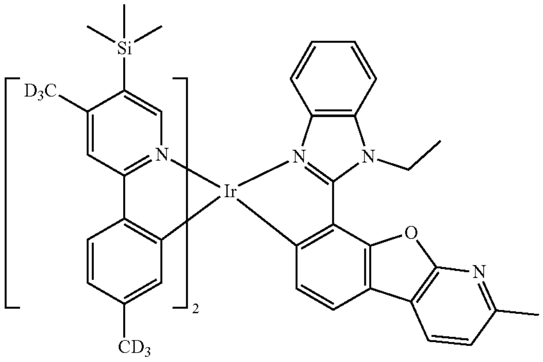

-continued
1012
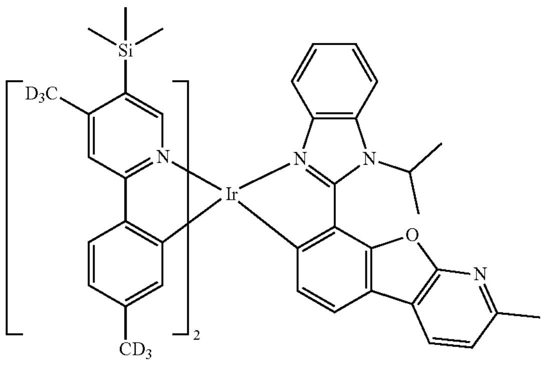
1013
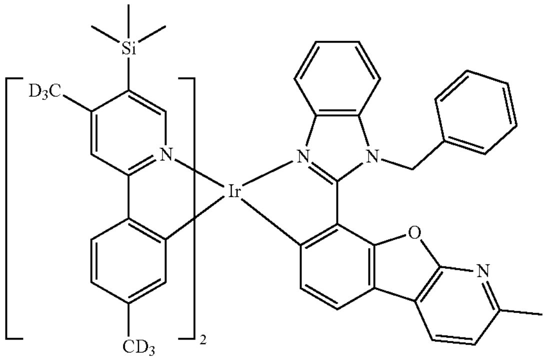
1014
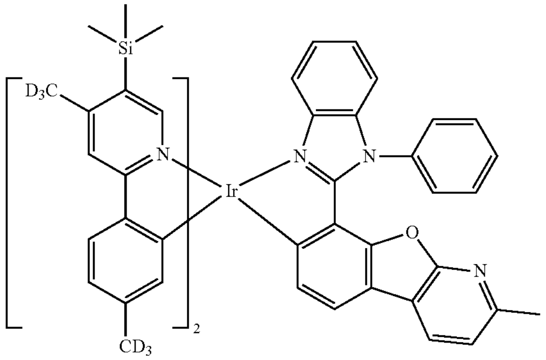
1015
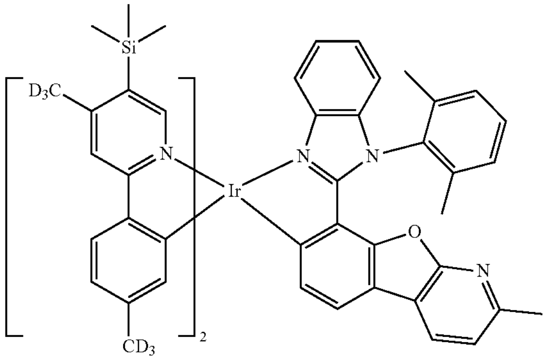
-continued
1016
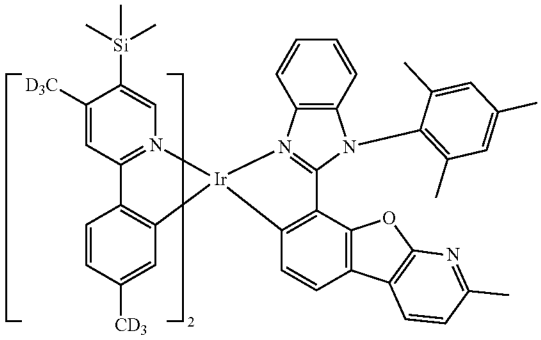
1017
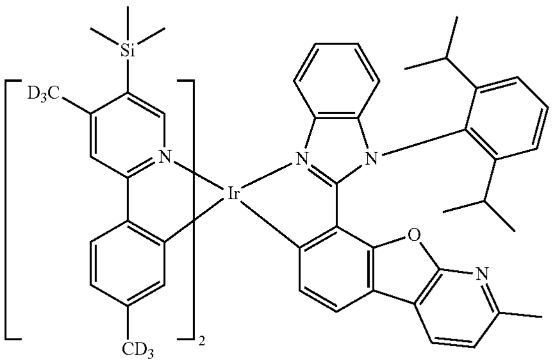
1018
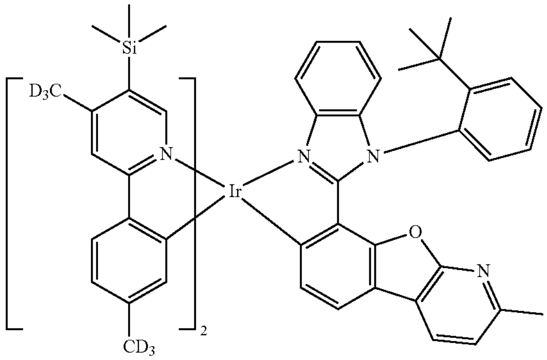
1019
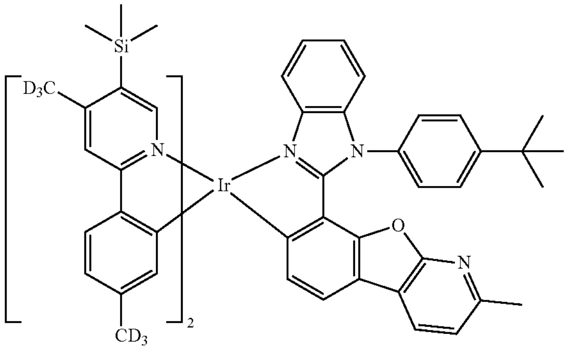

-continued
1020
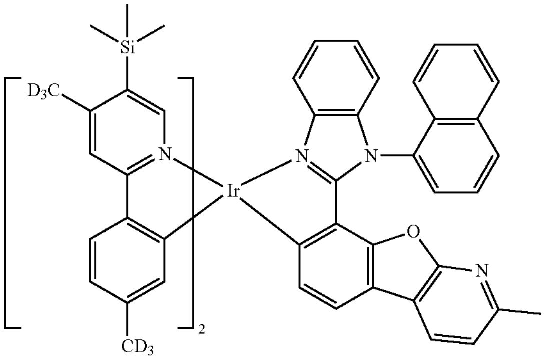
1021
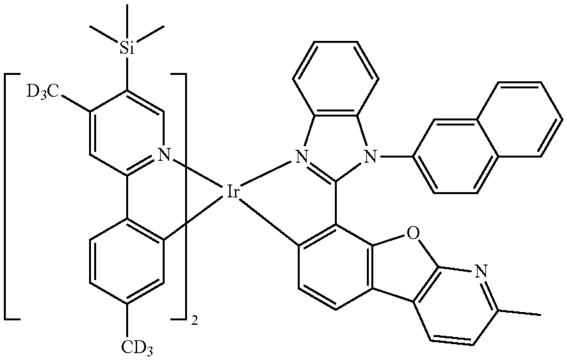
1022
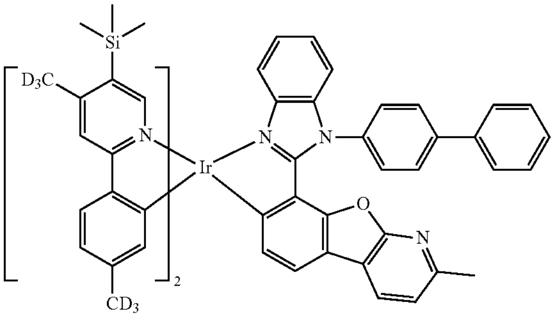
1023
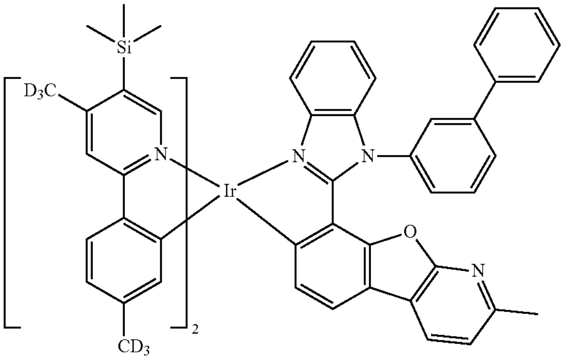
-continued
1024
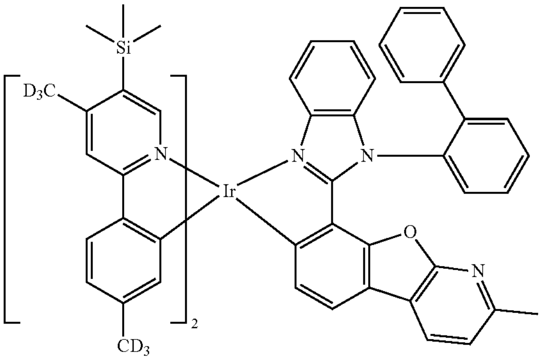
1025
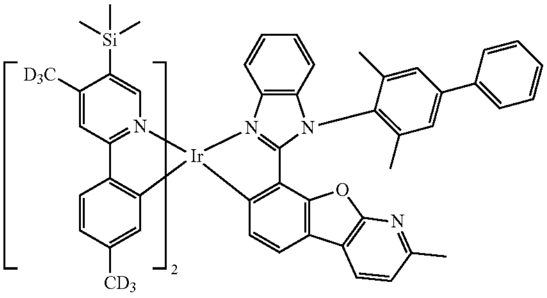
1026
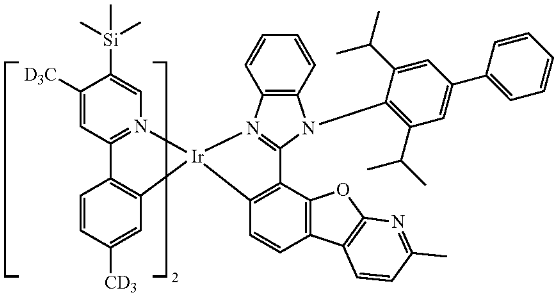
1027
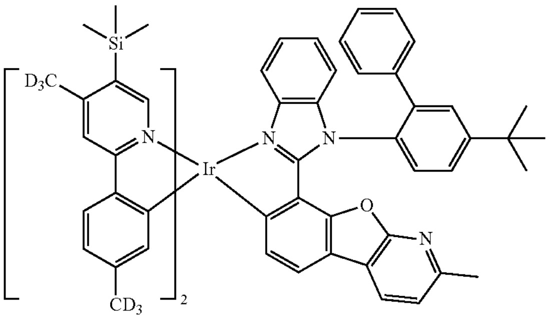

-continued
1028
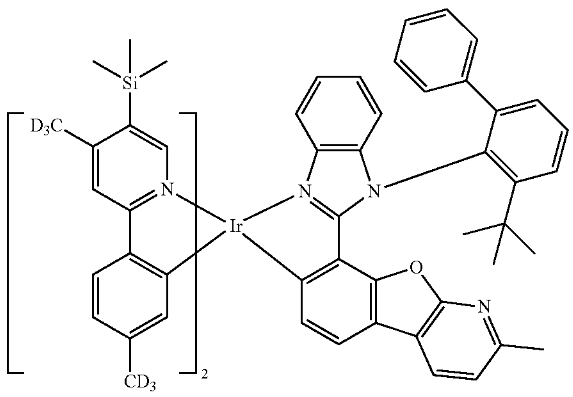
1029
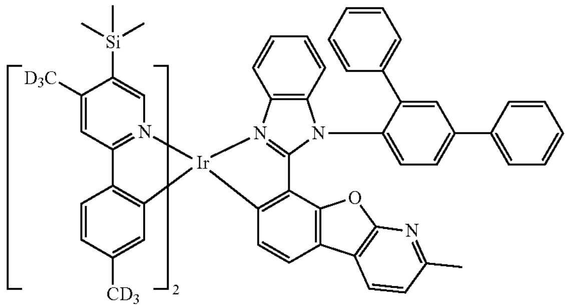
1030
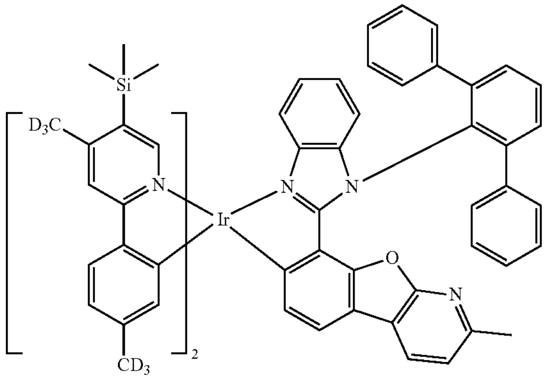
1031
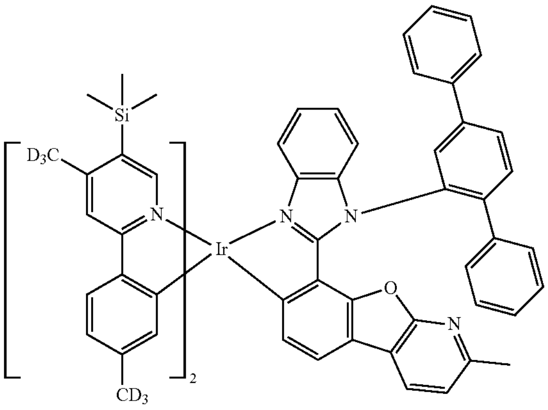
-continued
1032
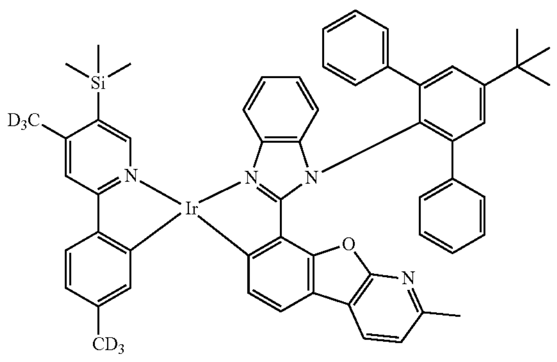
1033
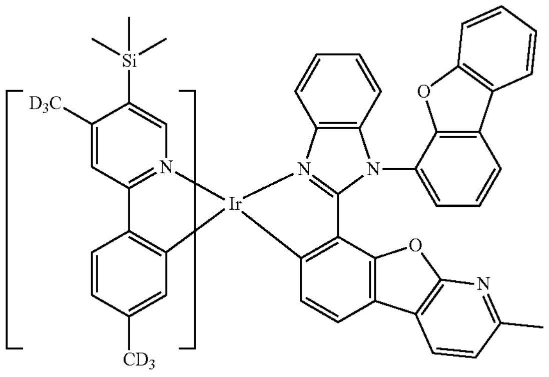
1034
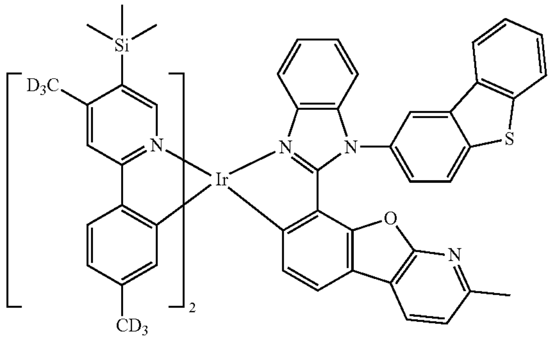
1035
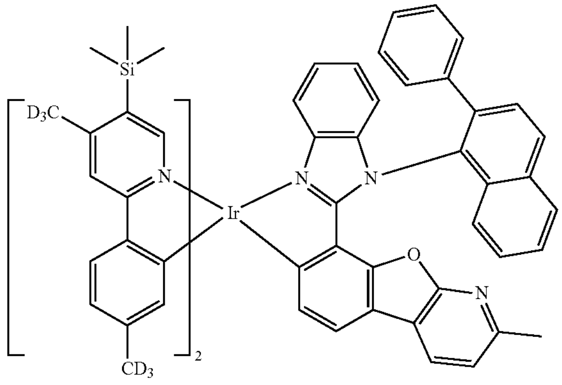

1036
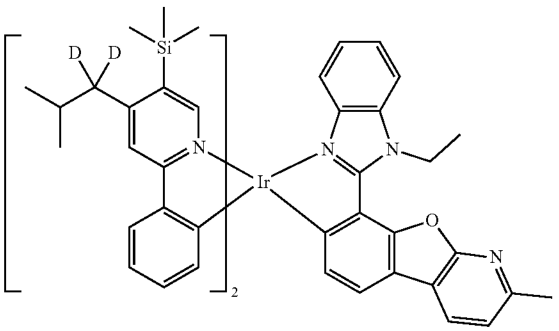
1037
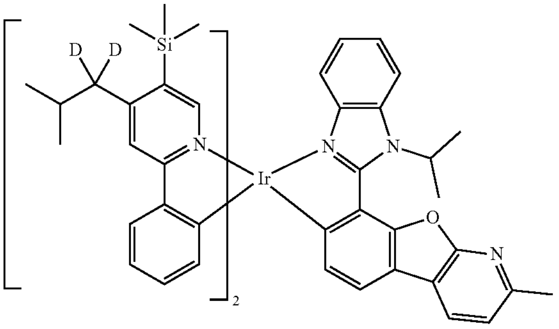
1038
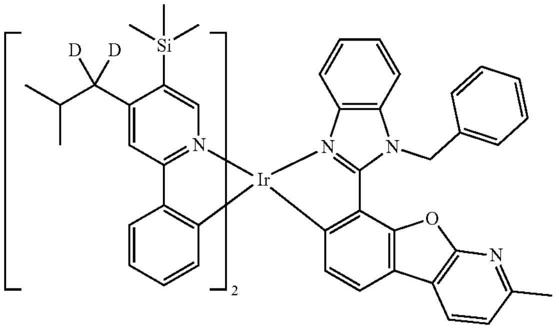
1039
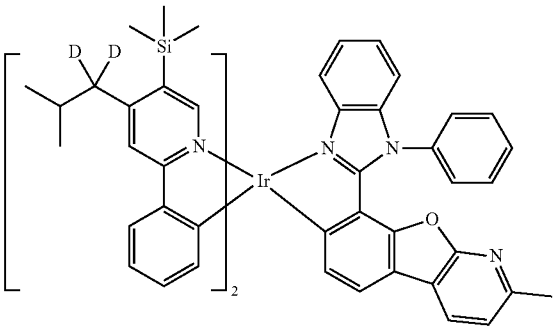
1040
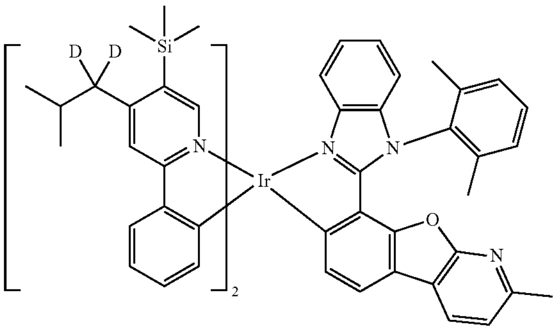
1041
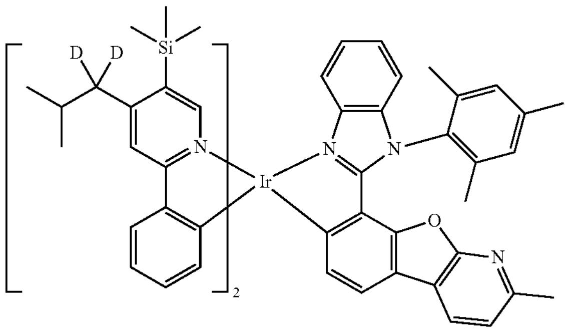
1042
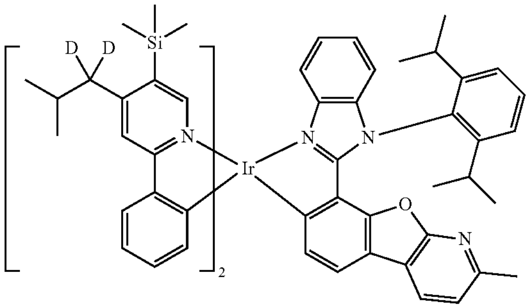
1043
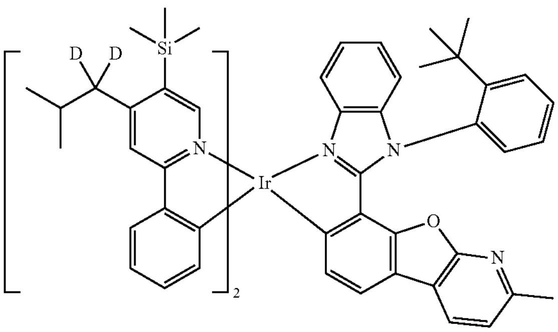

-continued
1044
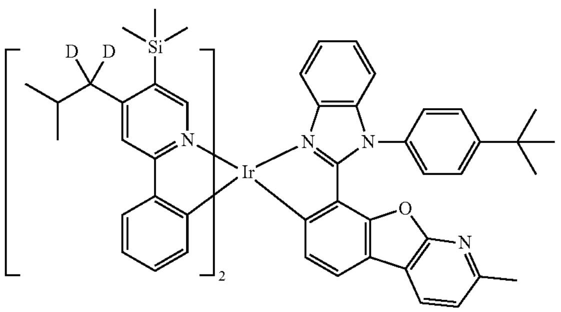
1045
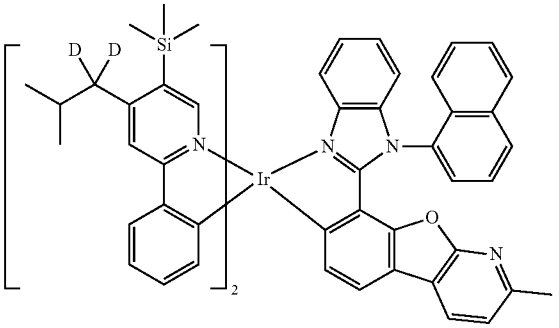
1046
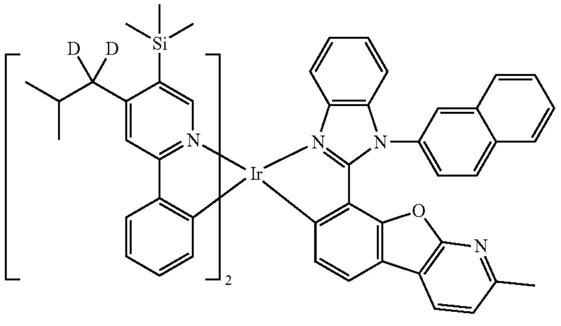
1047
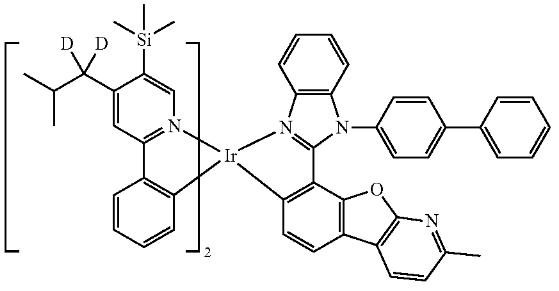
-continued
1048
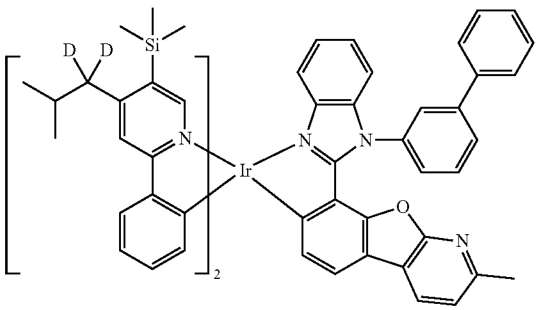
1049
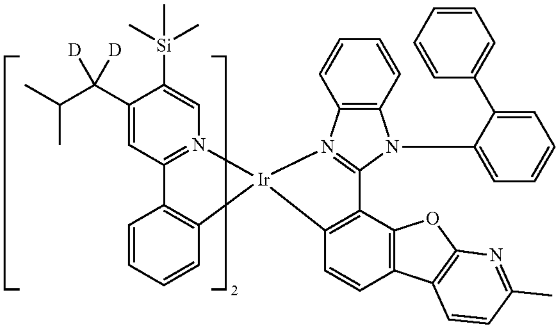
1050
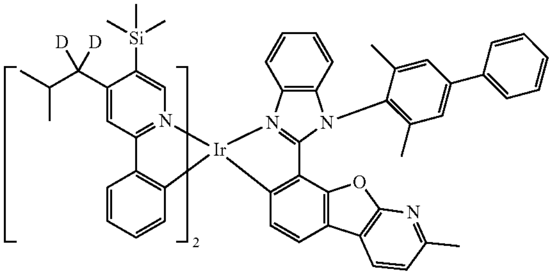
1051
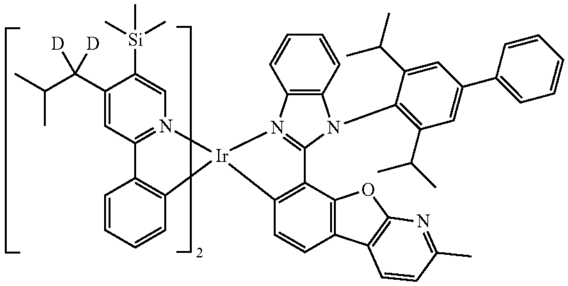
1052
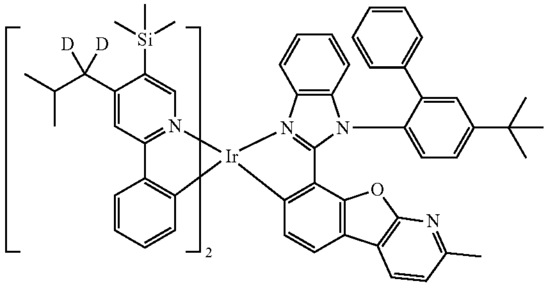

-continued
1053
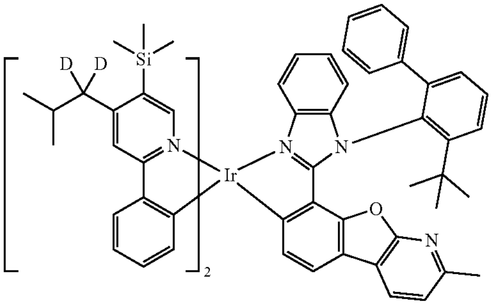
1054
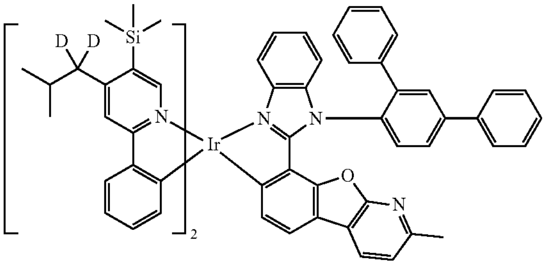
1055
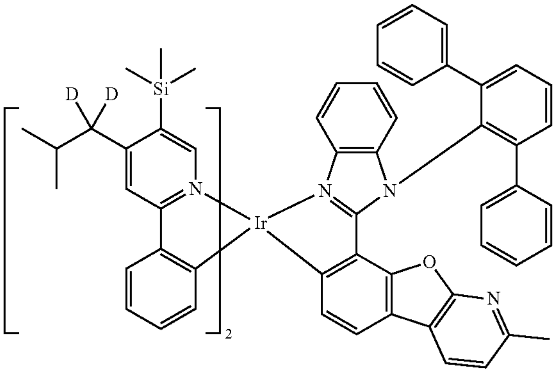
1056
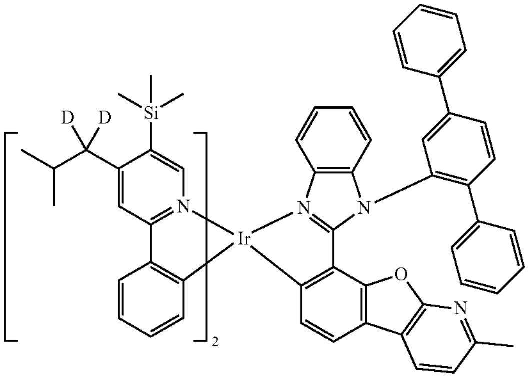
-continued
1057
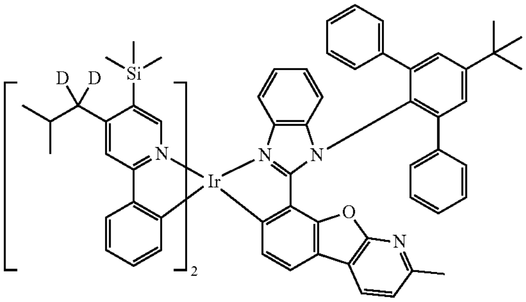
1058
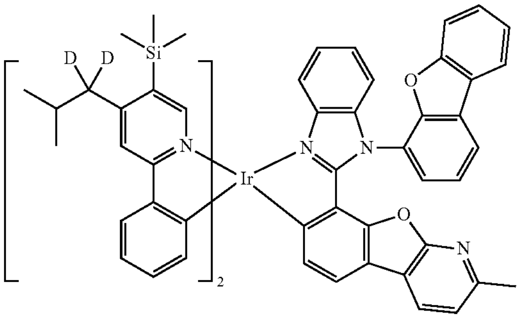
1059
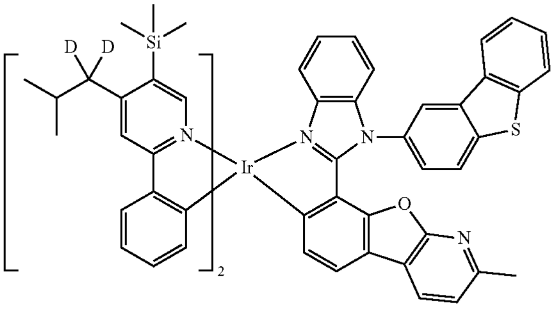
1060
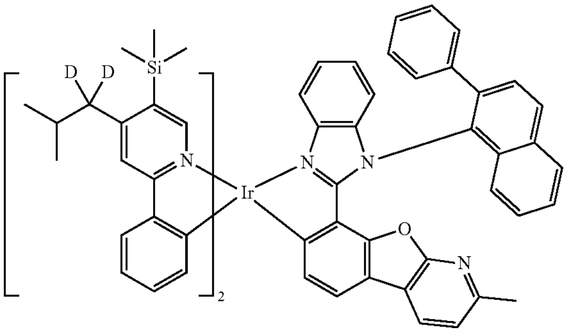

1061
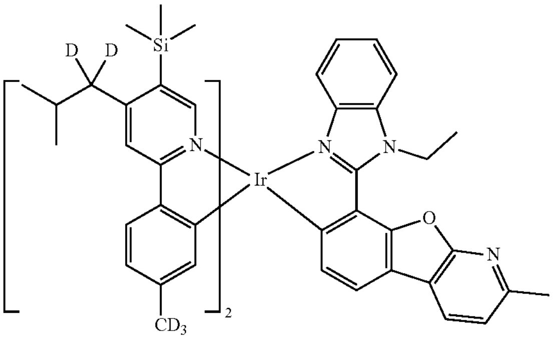
1062
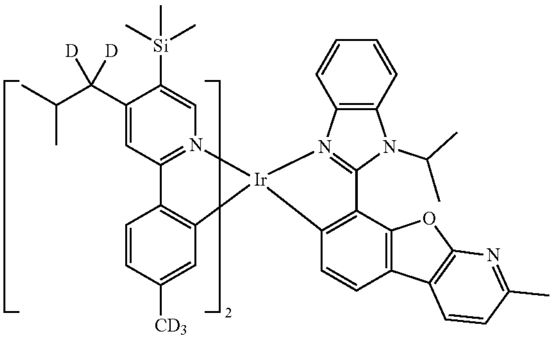
1063
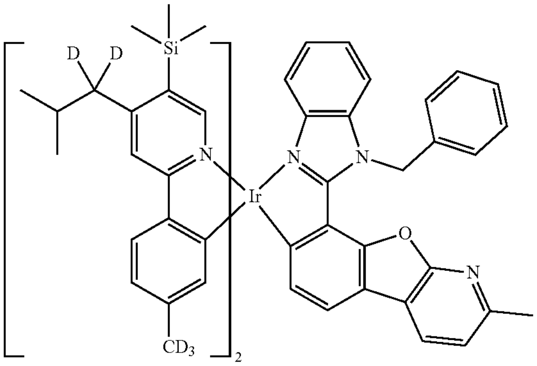
1064
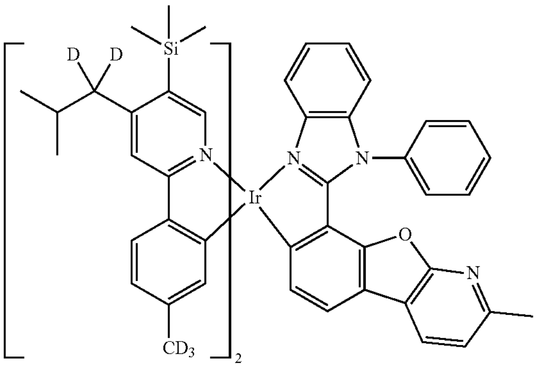
1065
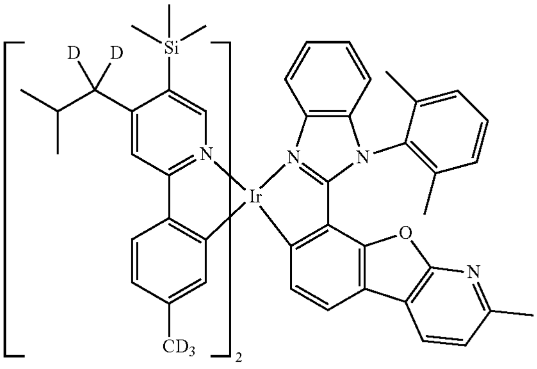
1066
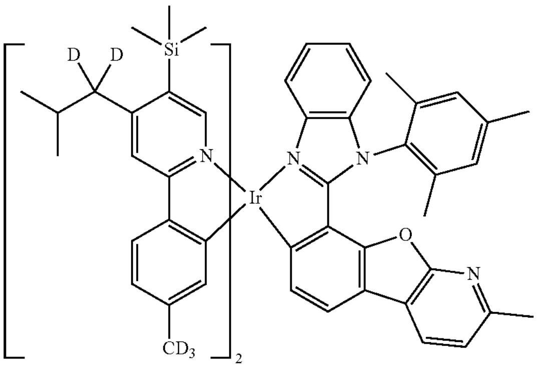
1067
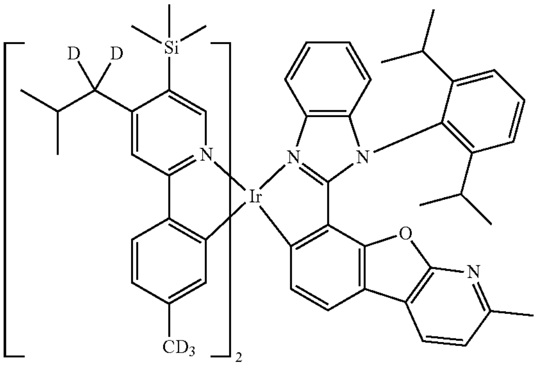
1068
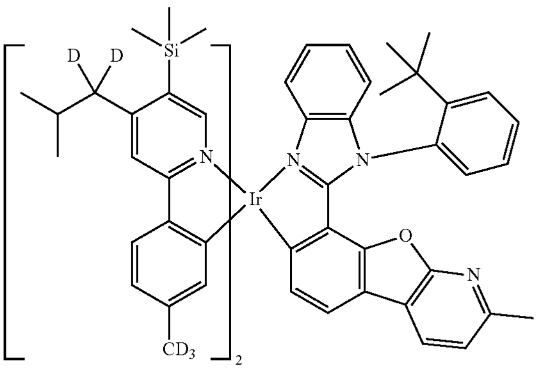

-continued
1069
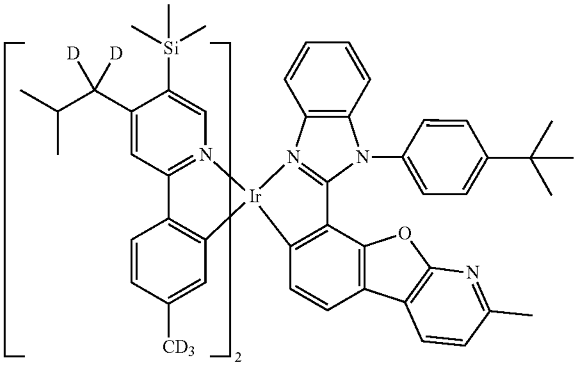
1070
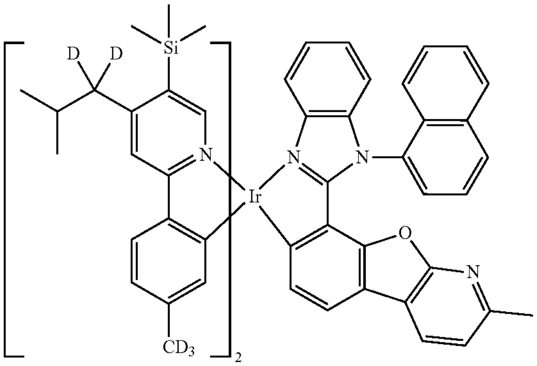
1071
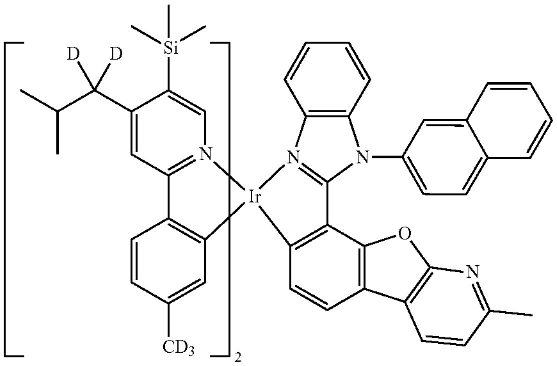
1072
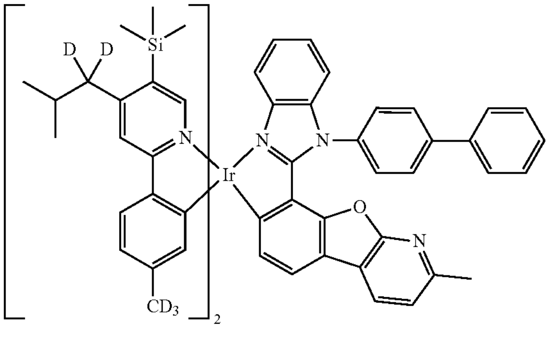
-continued
1073
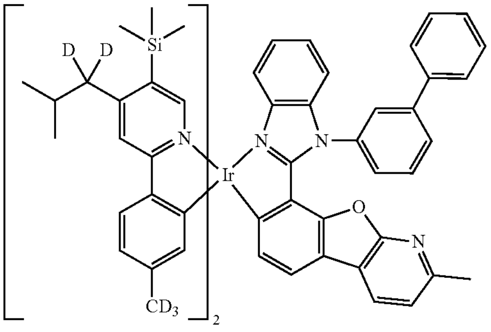
1074
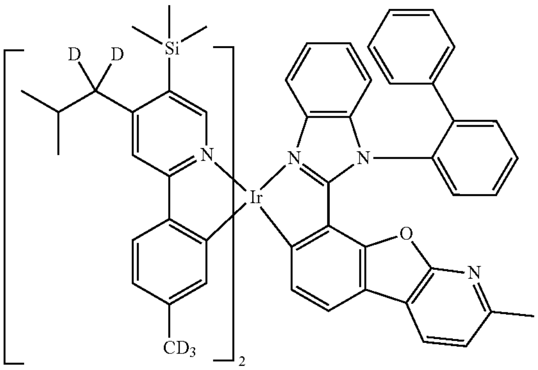
1075
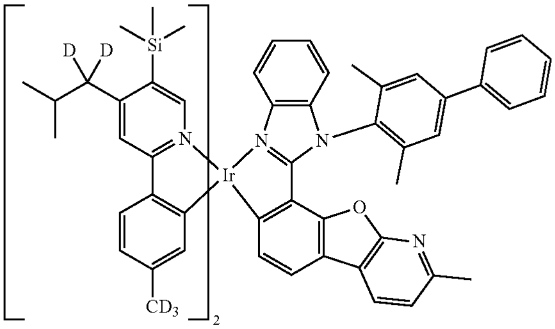
1076
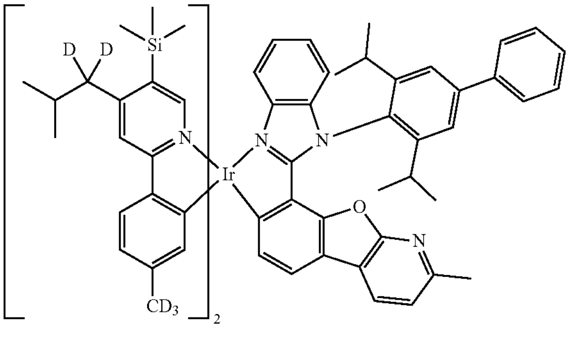

-continued
1077
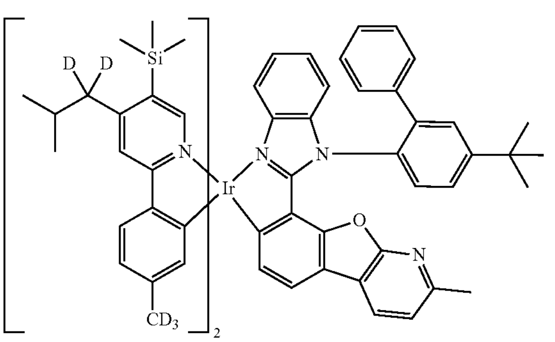
1078
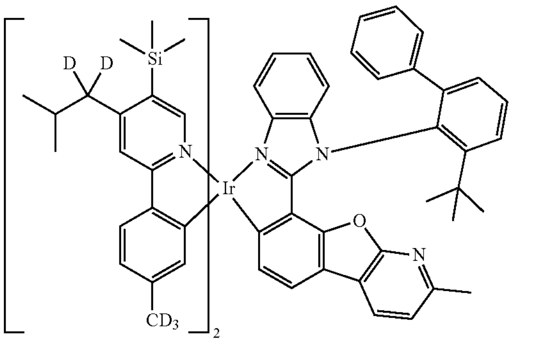
1079
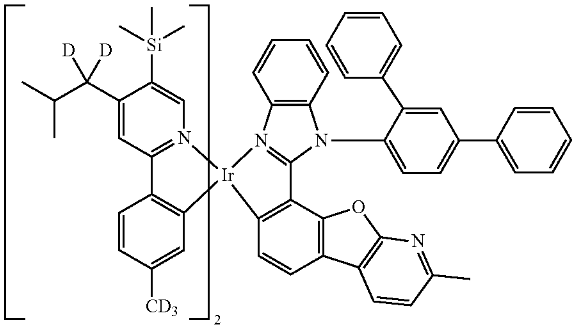
1080
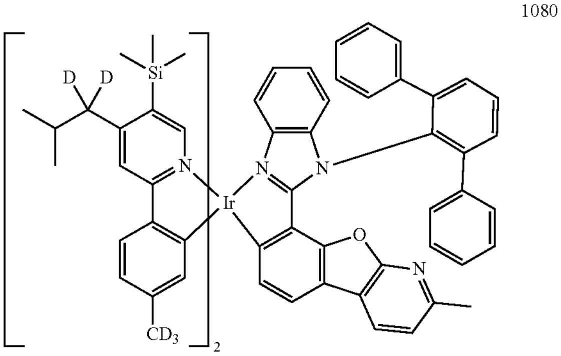
-continued
1081
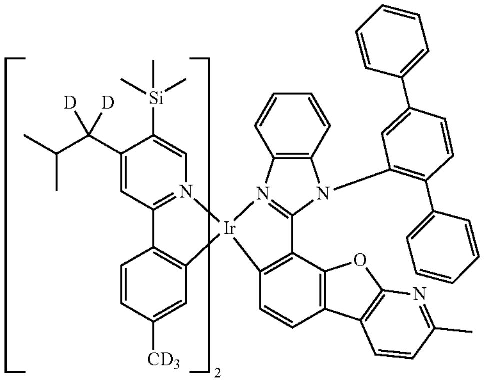
1082
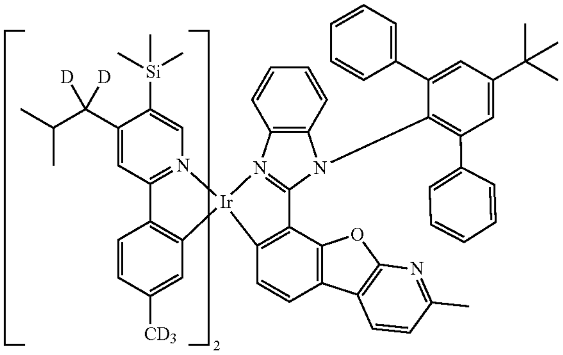
1083
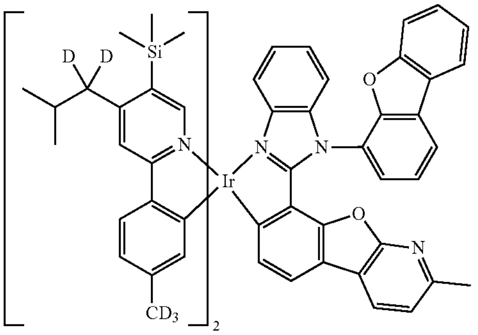
1084
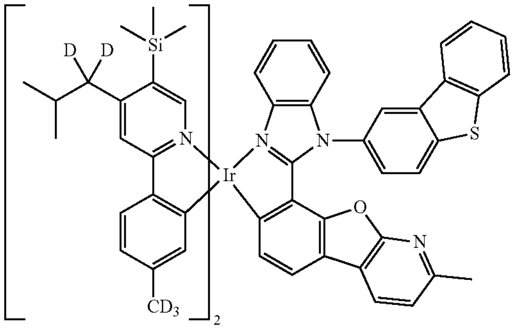

-continued
1085
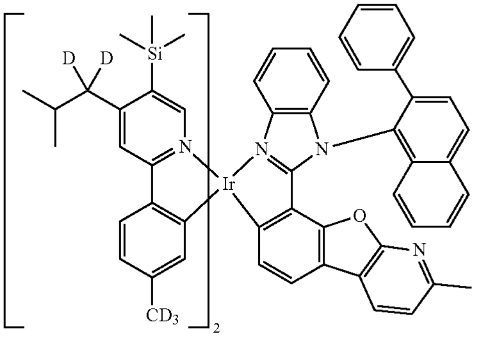
1086
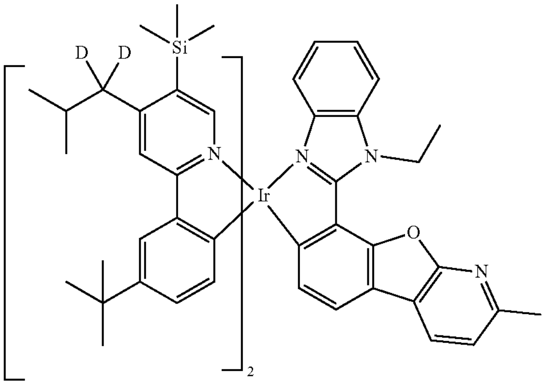
1087
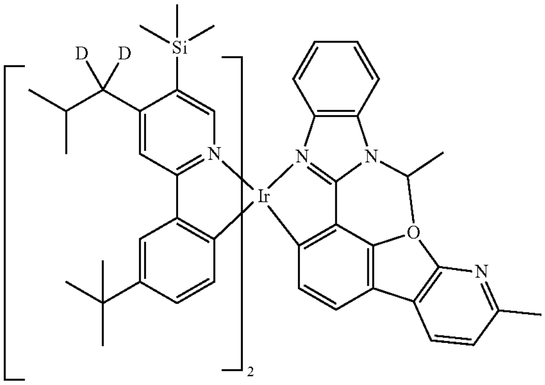
1088
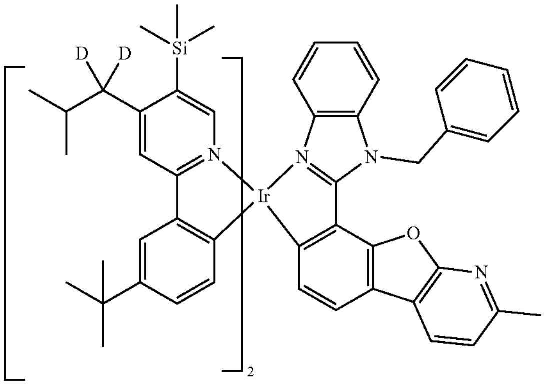
-continued
1089
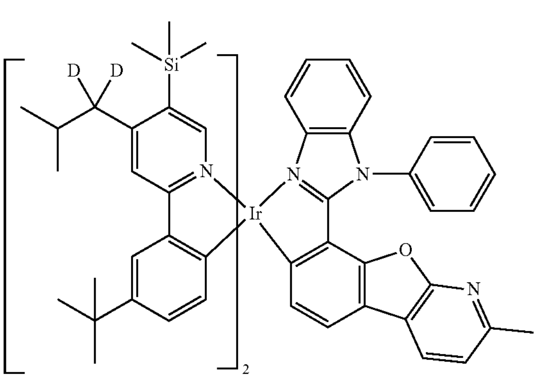
1090
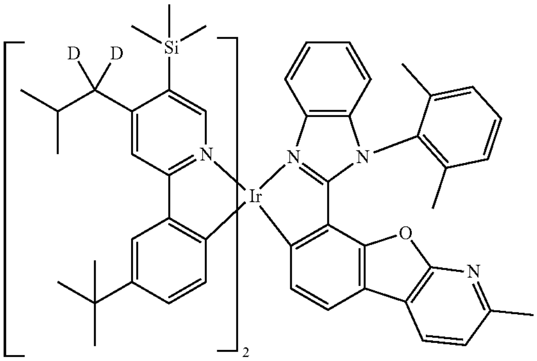
1091
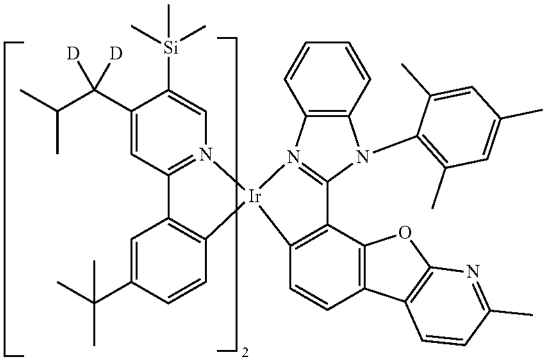
1092
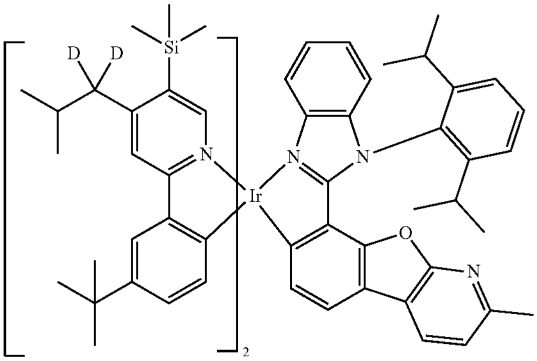

-continued
1093
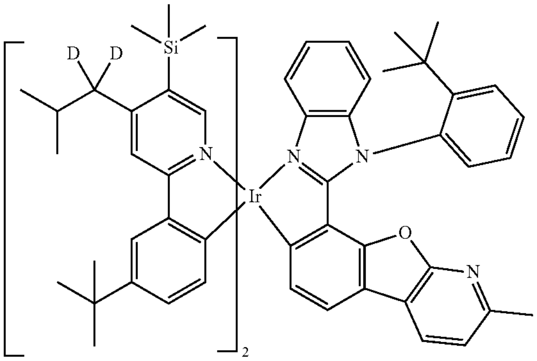
1094
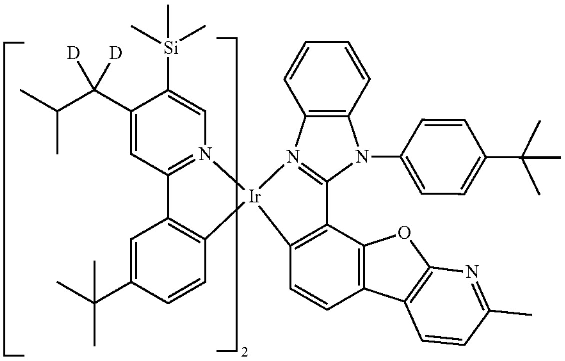
1095
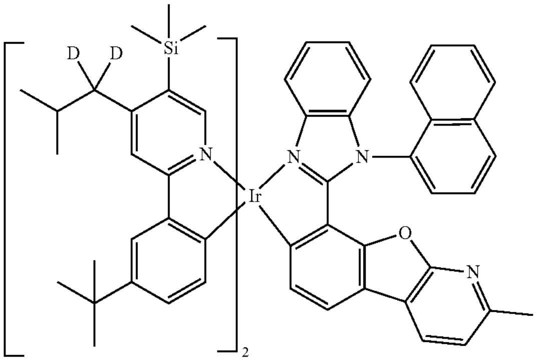
1096
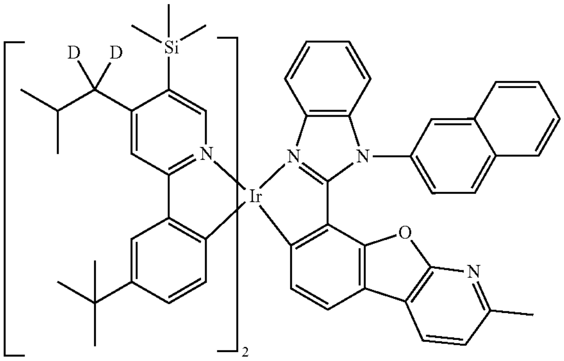
-continued
1097
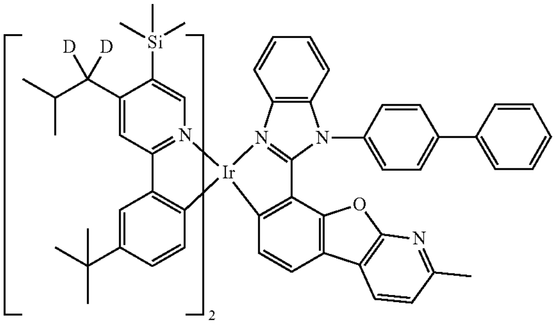
1098
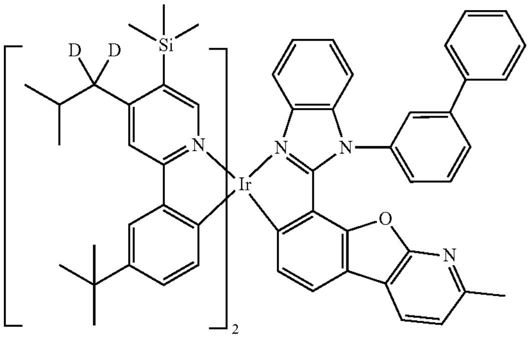
1099
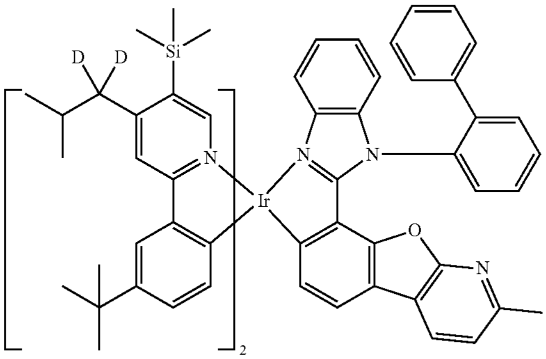
1100
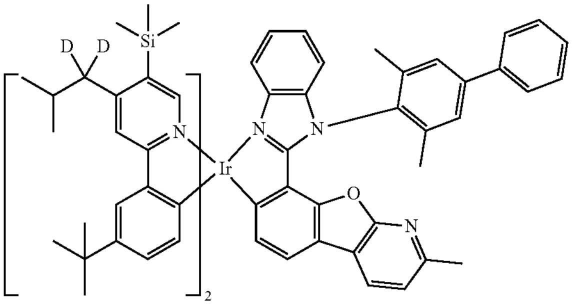

-continued
1101
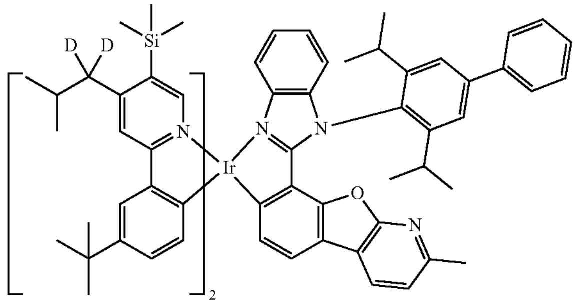
1102
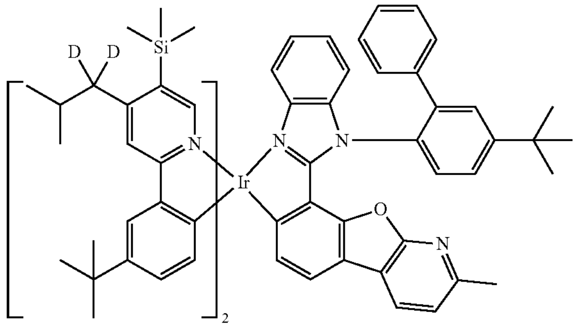
1103
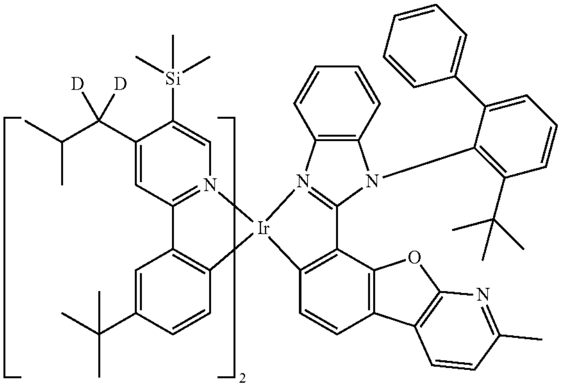
1104
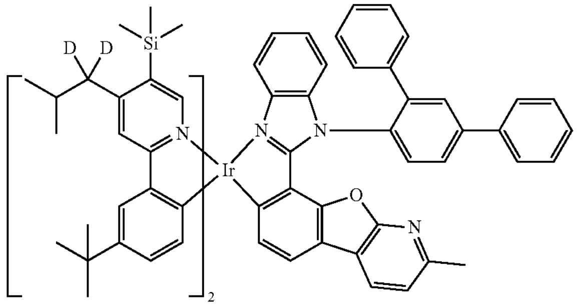
-continued
1105
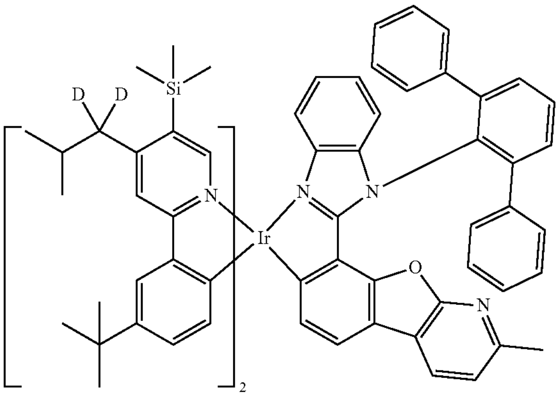
1106
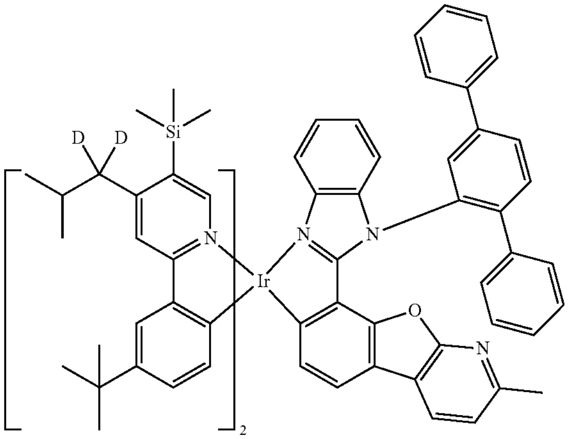
1107
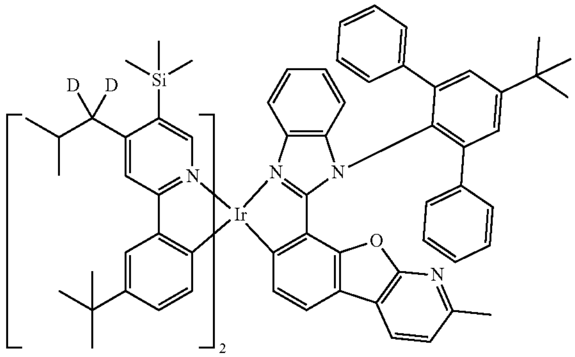
1108
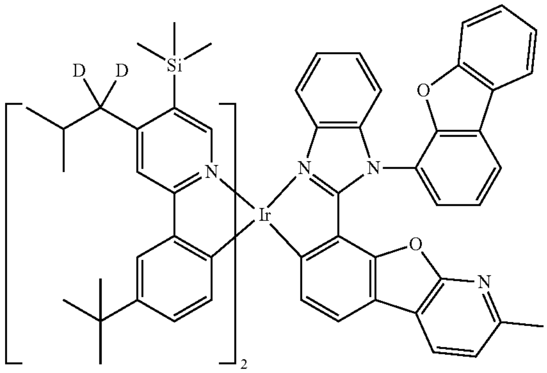

-continued
1109
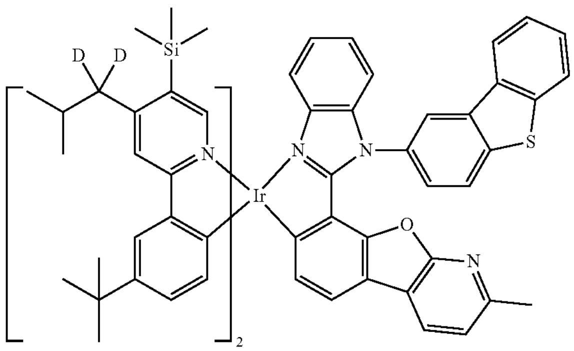
1110
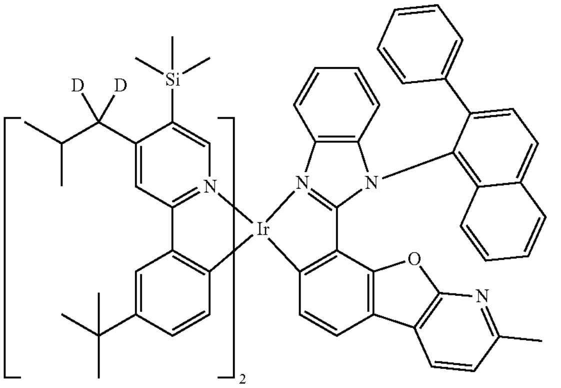
1111
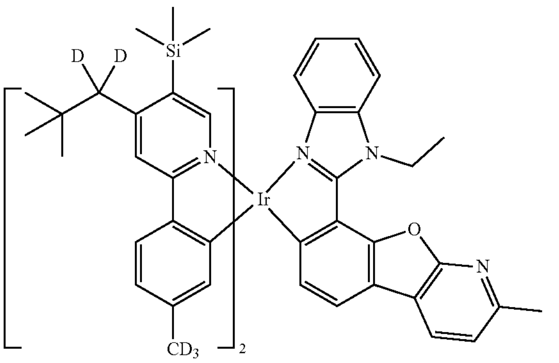
1112
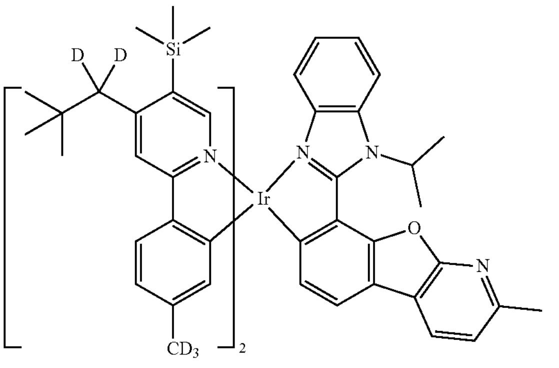
-continued
1113
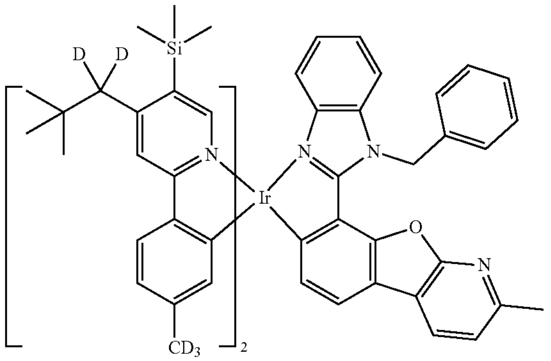
1114
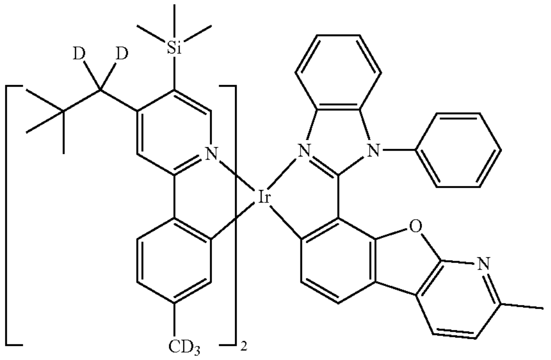
1115
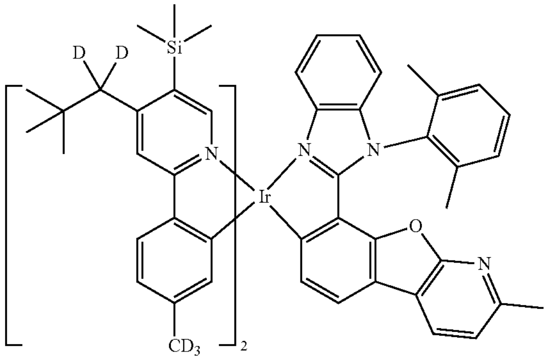
1116
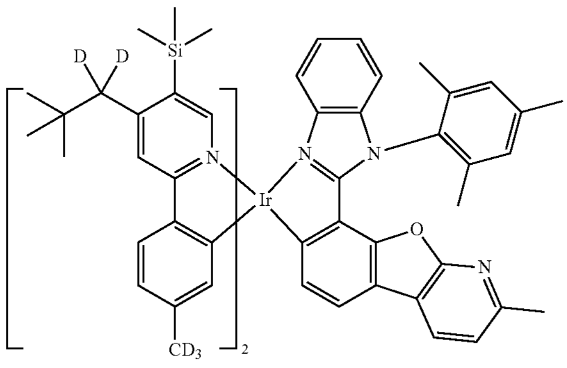

1117
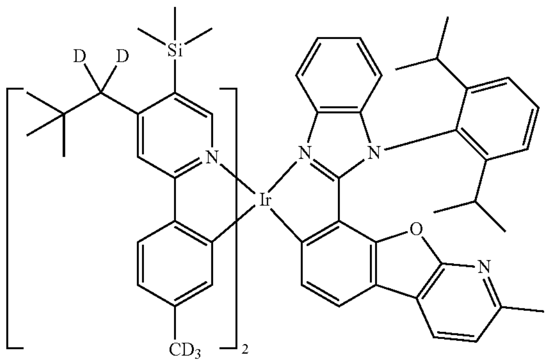
1118
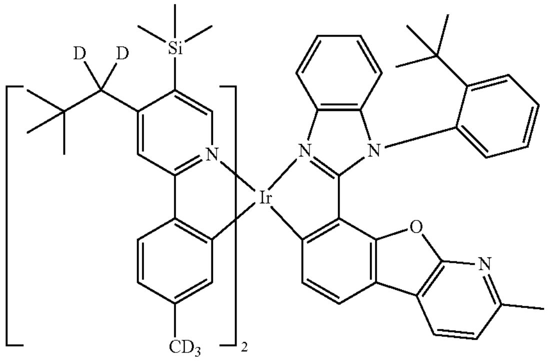
1119
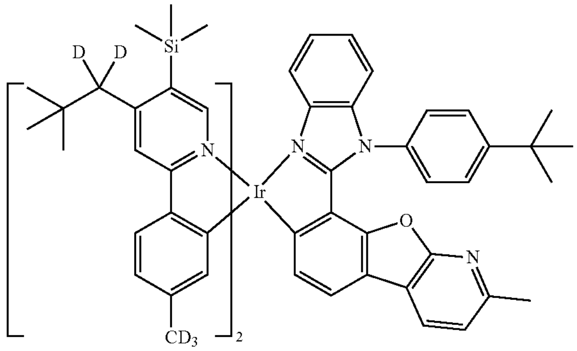
1120
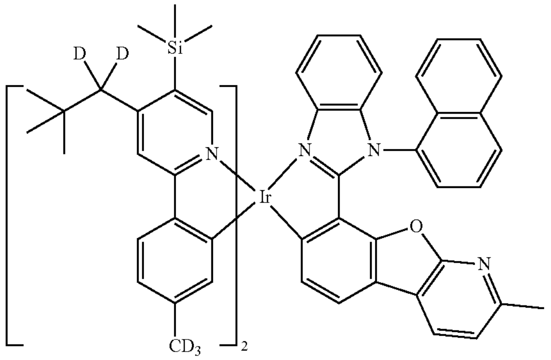
1121
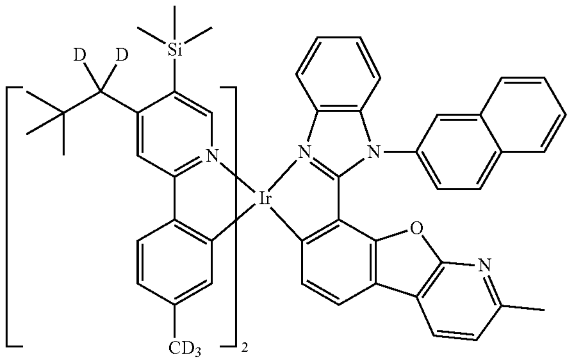
1122
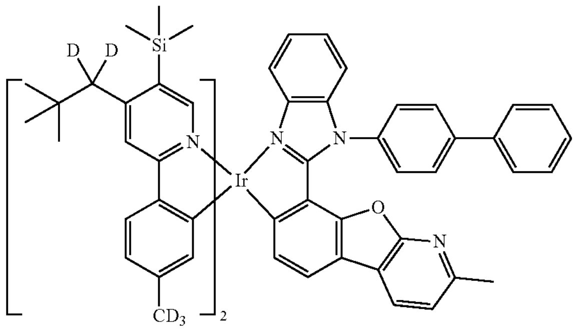
1123
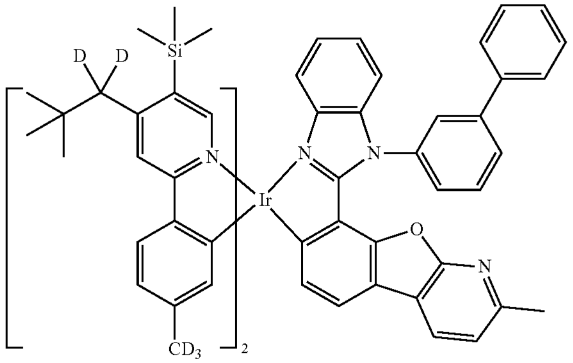
1124
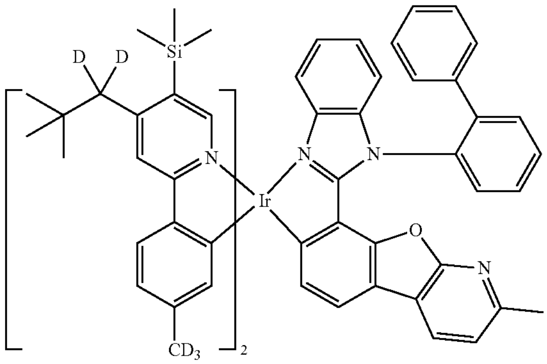

-continued
1125
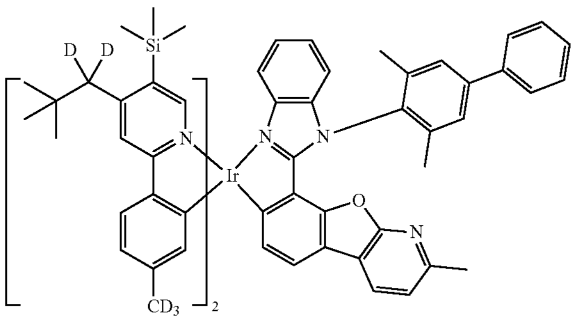
1126
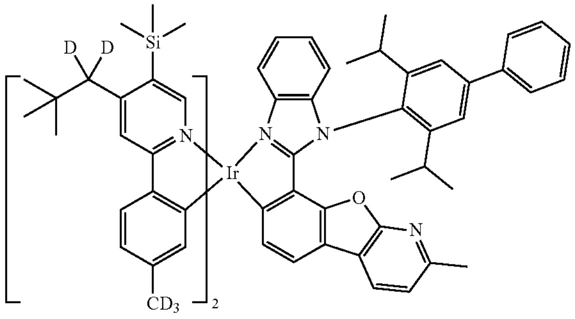
1127
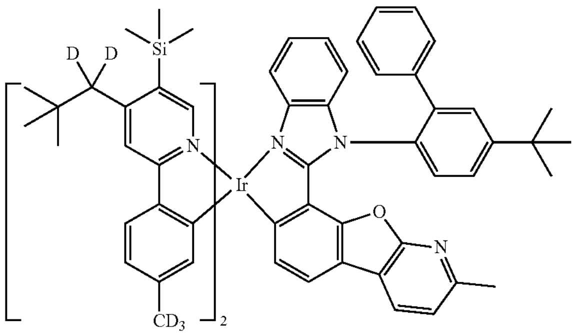
1128
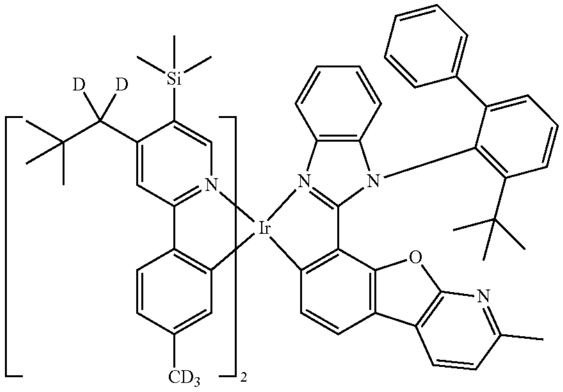
-continued
1129
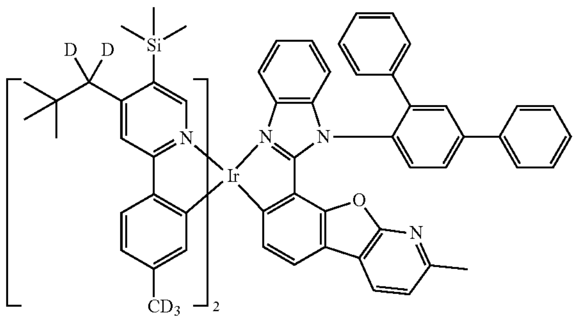
1130
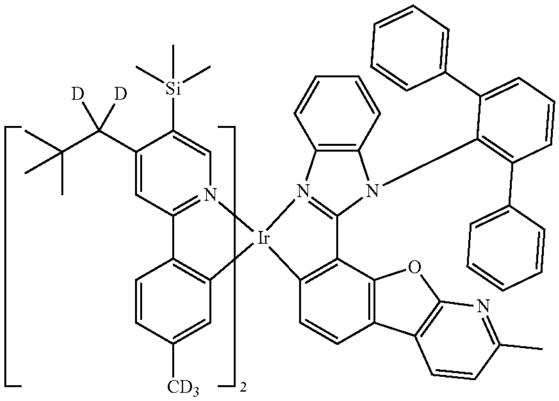
1131
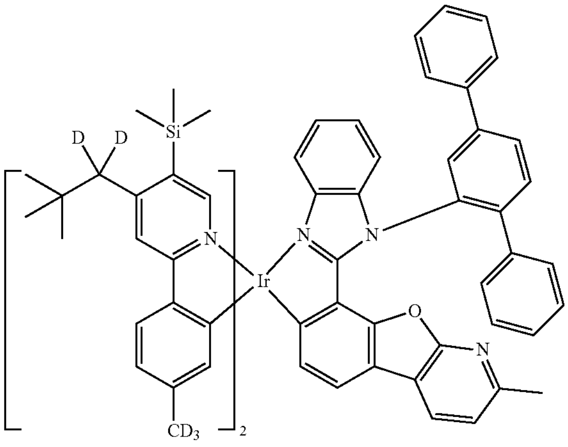
1132
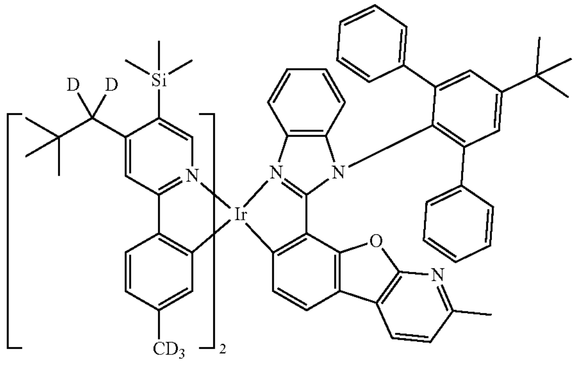

-continued
1133
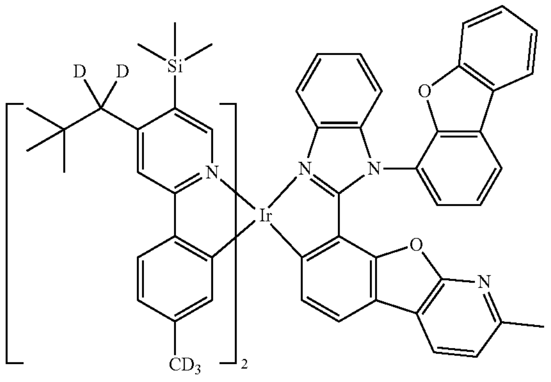
1134
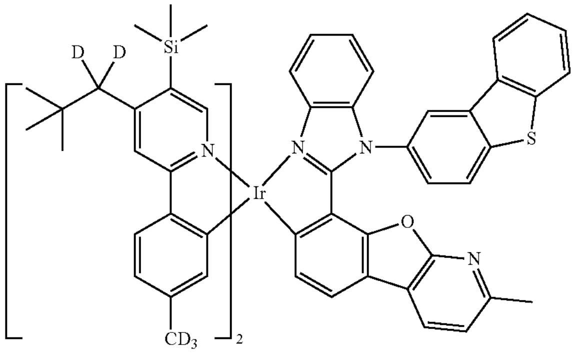
1135
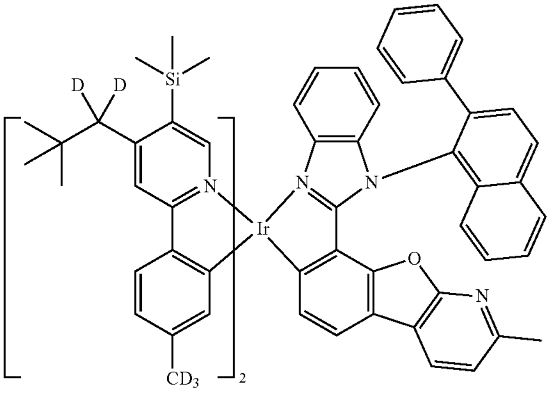
1136
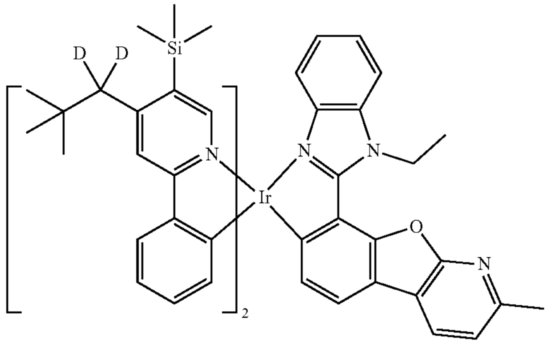
-continued
1137
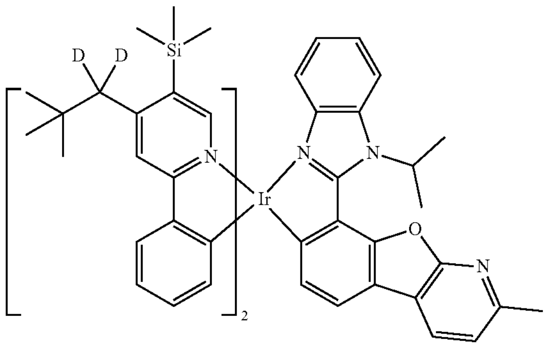
1138
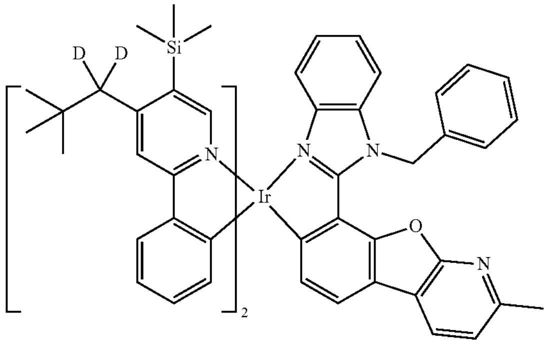
1139
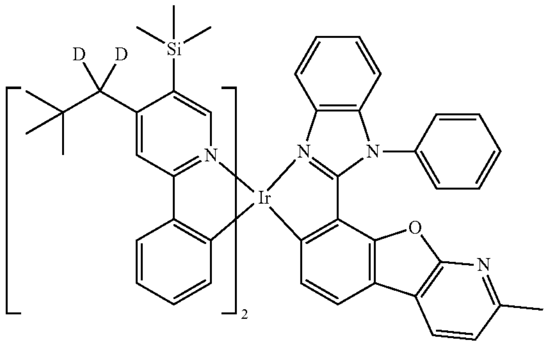
1140
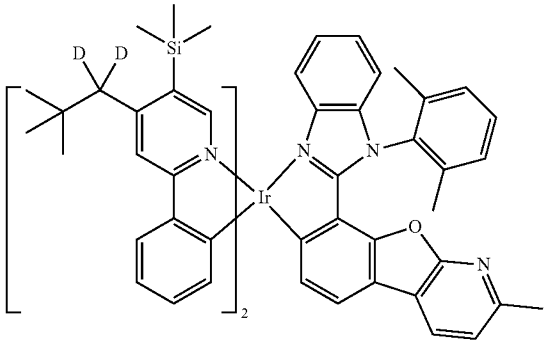

-continued
1141
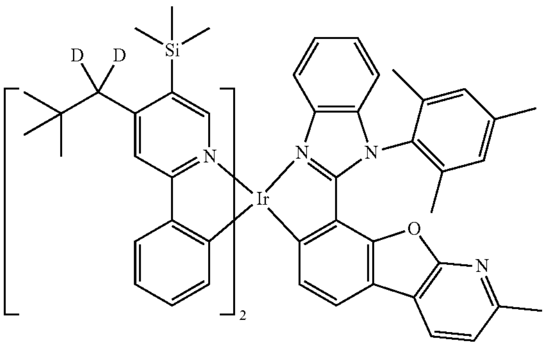
1142
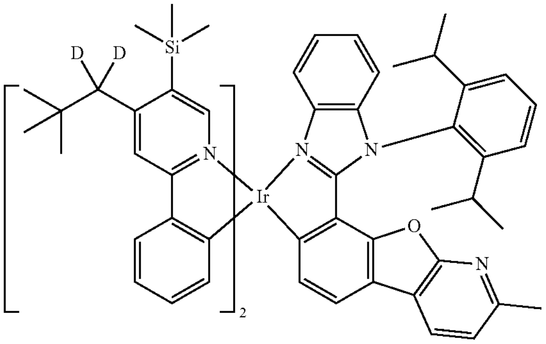
1143
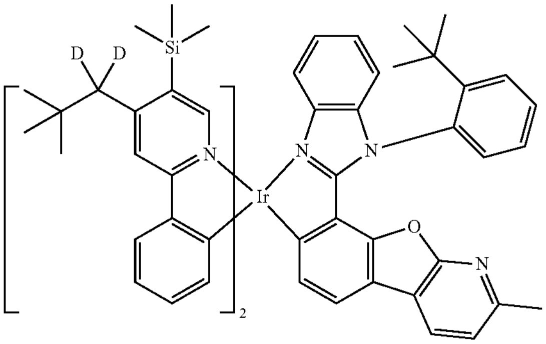
1144
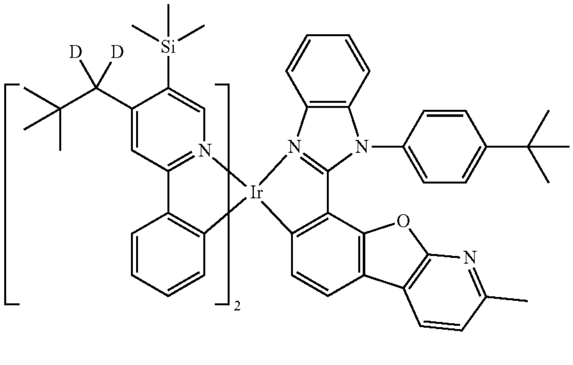
-continued
1145
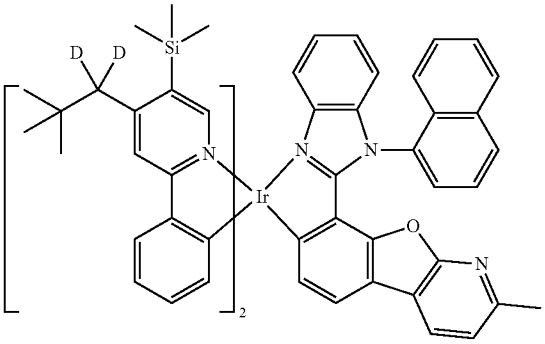
1146
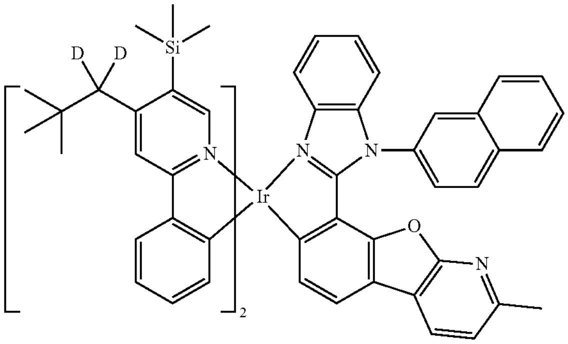
1147
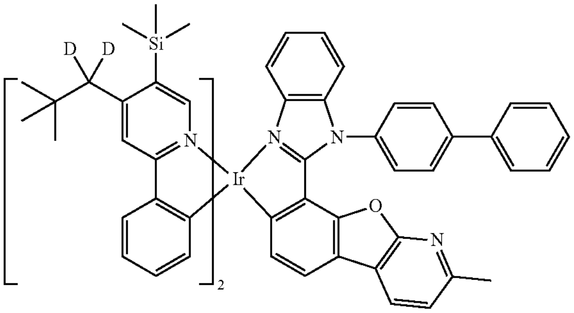
1148
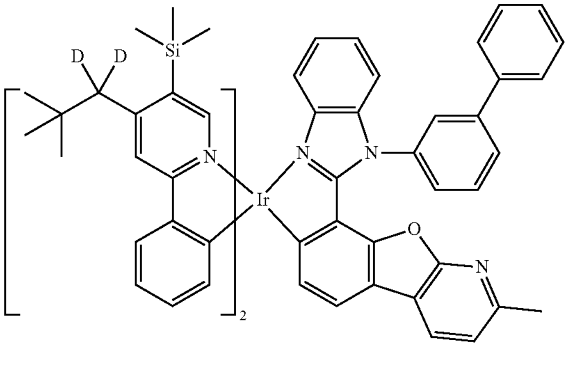

-continued
1149
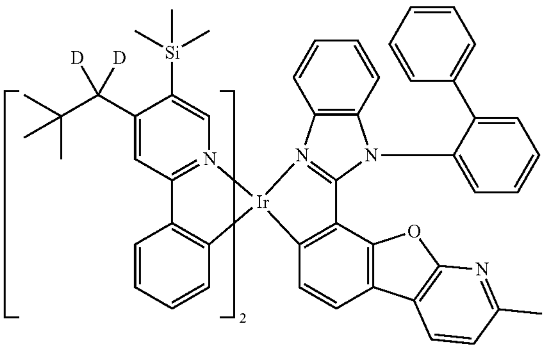
1153
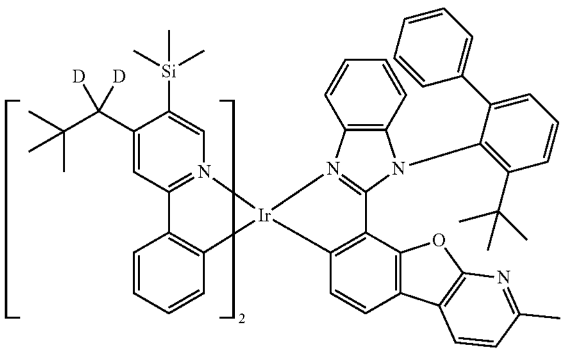
1150
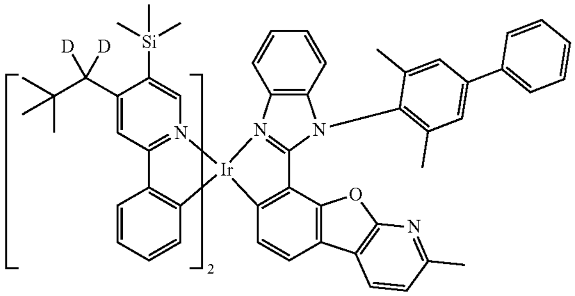
1154
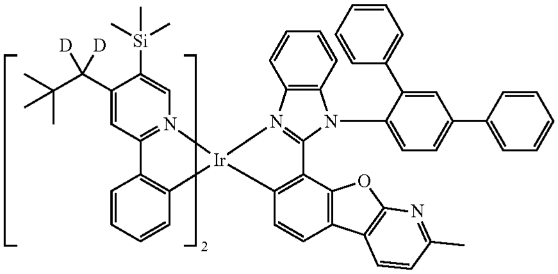
1151
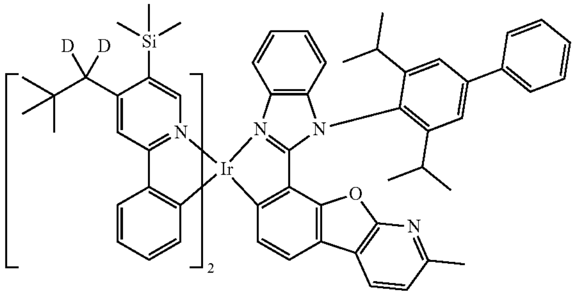
1155
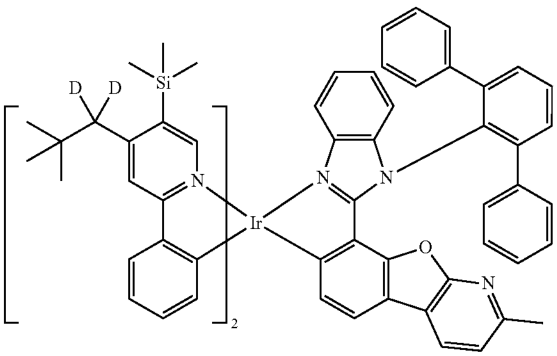
1152
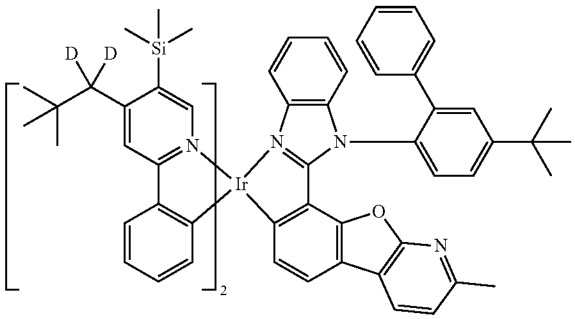
1156
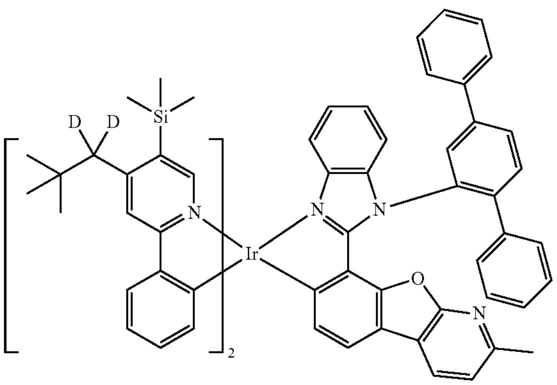

-continued
1157
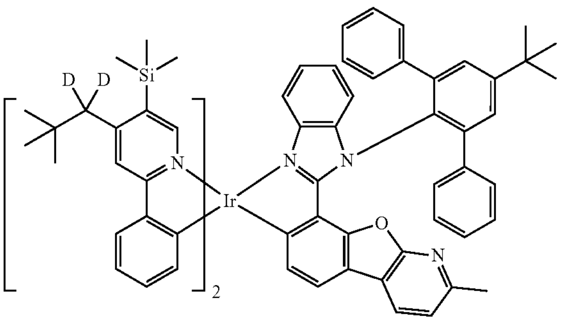
1158
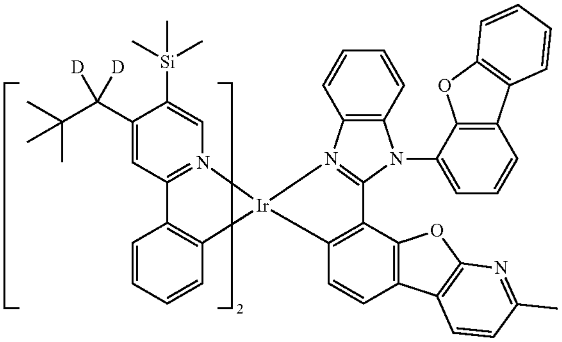
1159
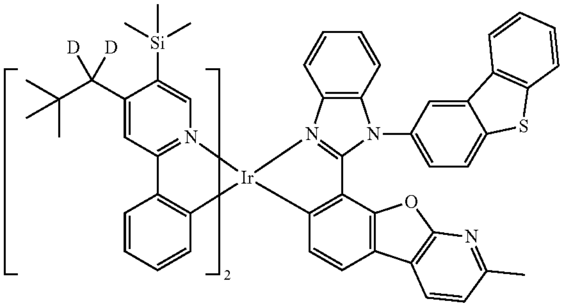
1160
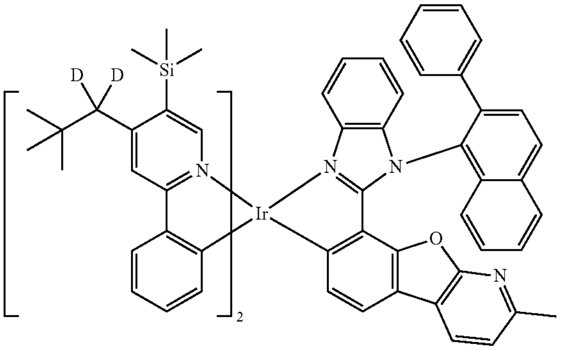
-continued
1161
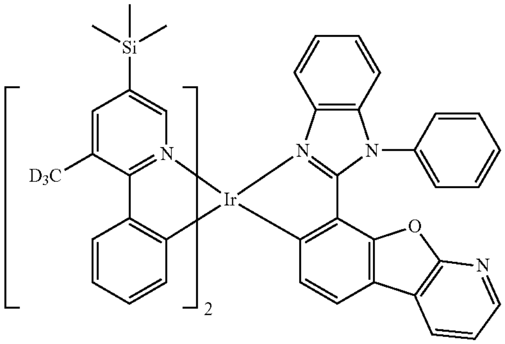
1162
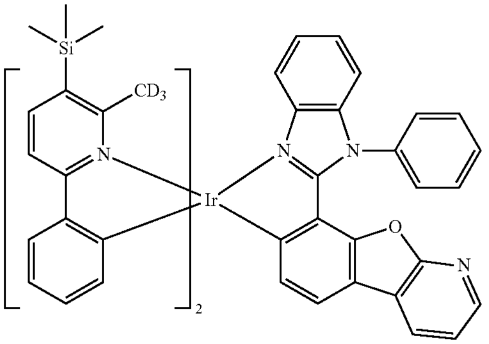
1163
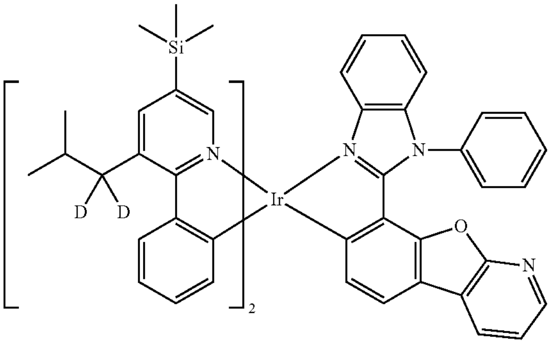
1164
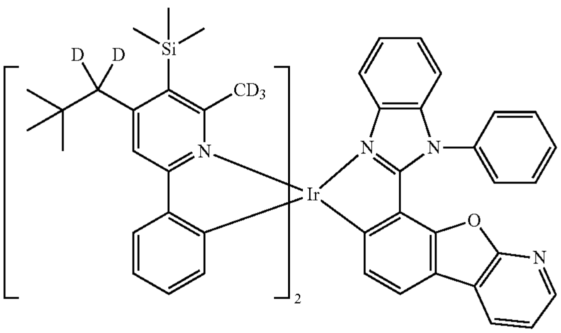

-continued
1165
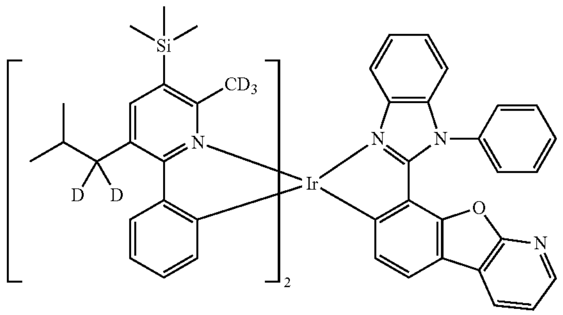
1166
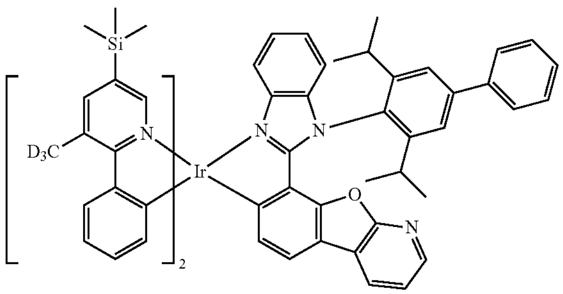
1167
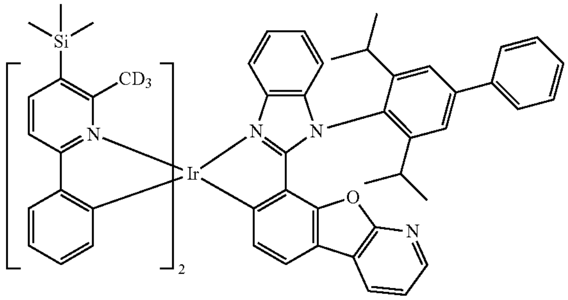
1168
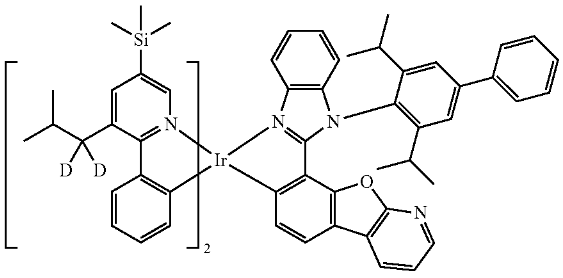
1169
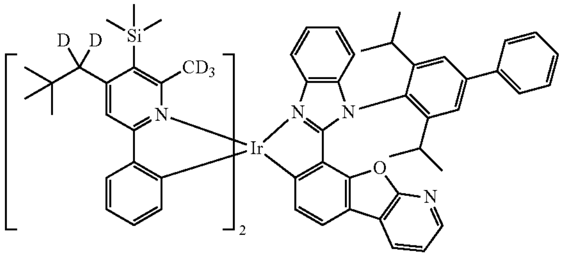
-continued
1170
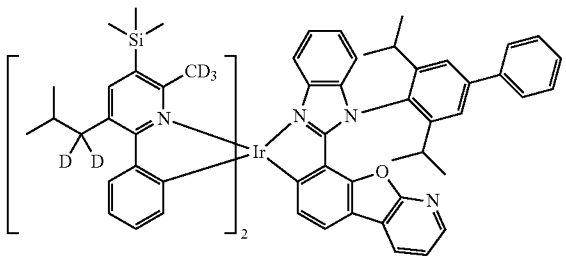
1171
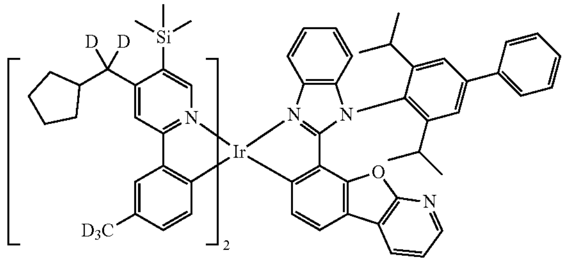
1172
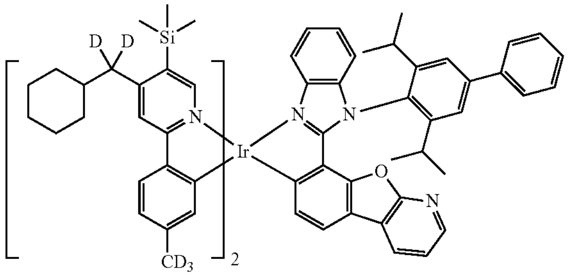
1173
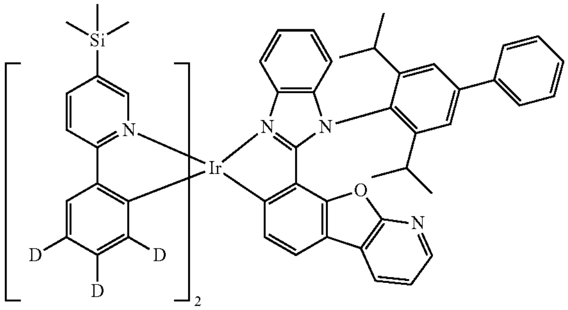
1174
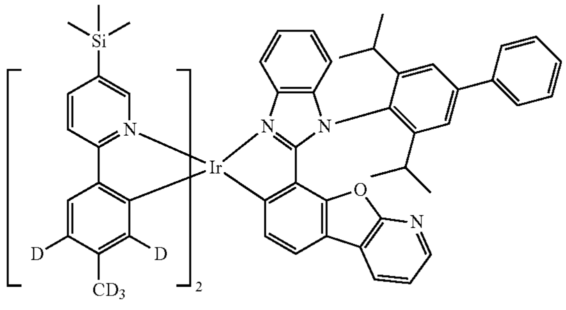

-continued
1175
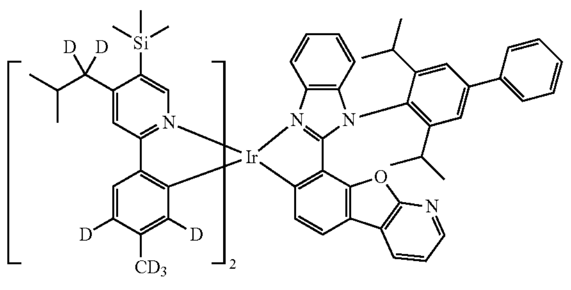
1176
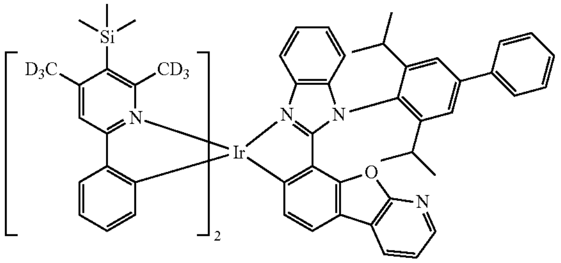
1177
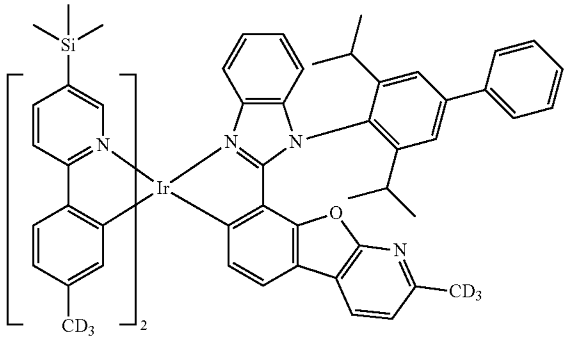
1178
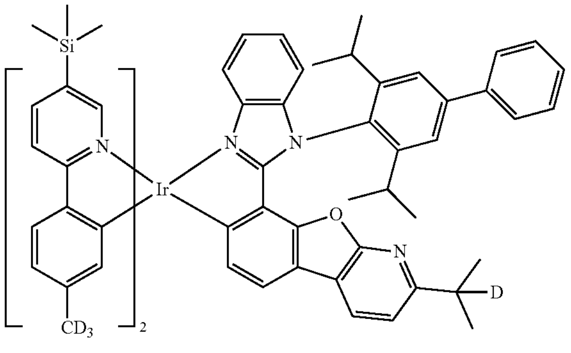
1179
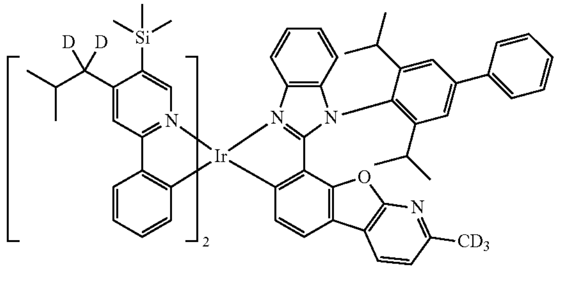
-continued
1180
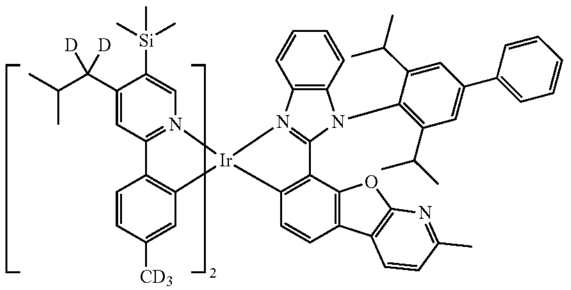
1181
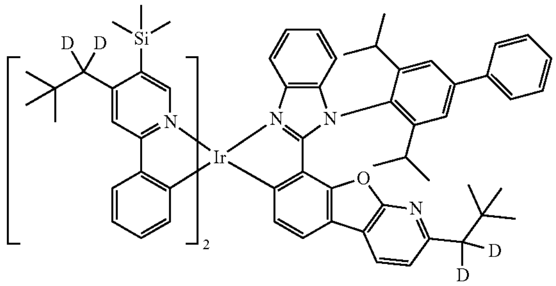
1182
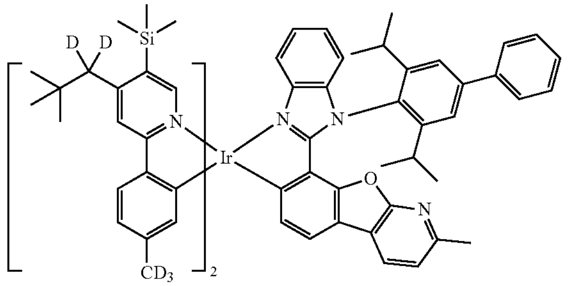
1183
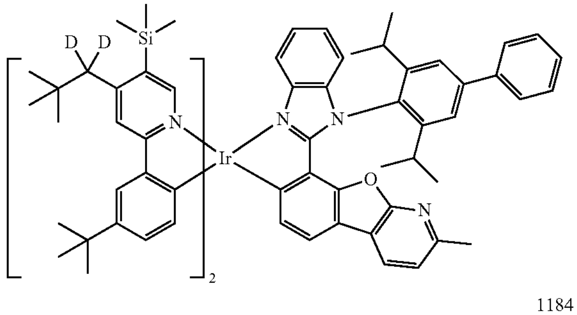
1184
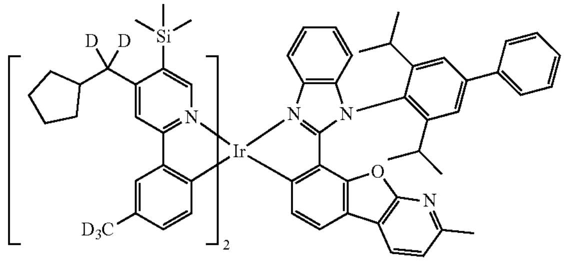

1185
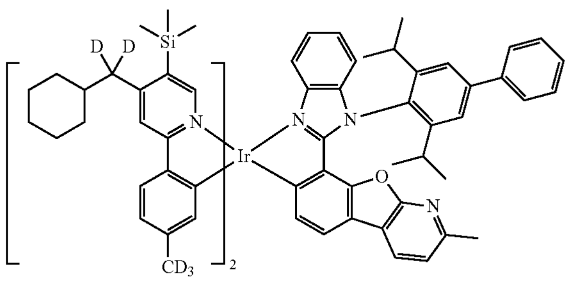
1186
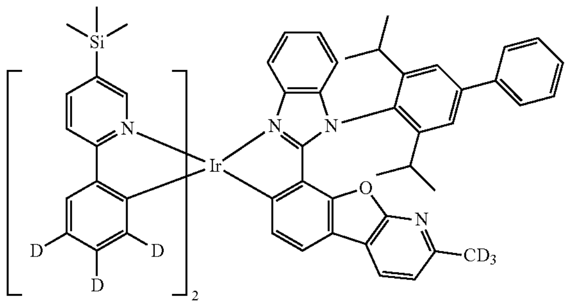
1187
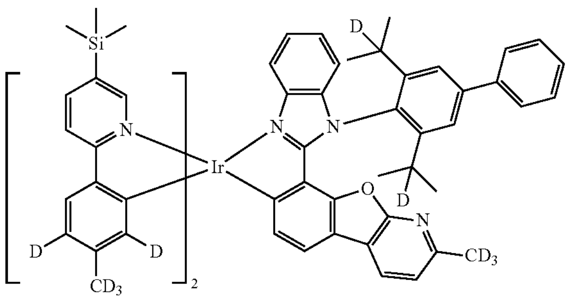
1188
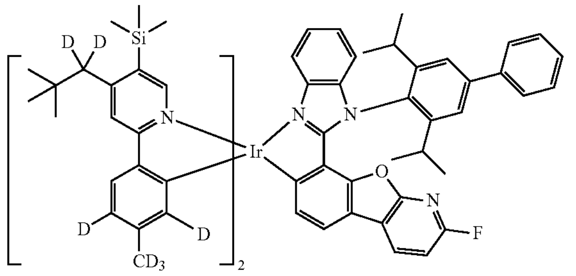
1189
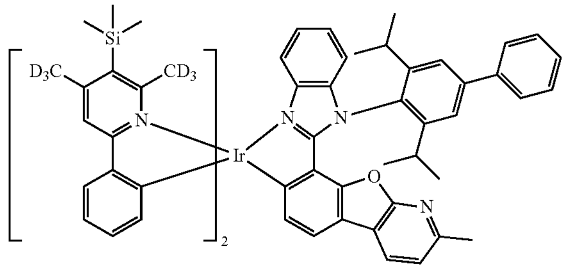
1190
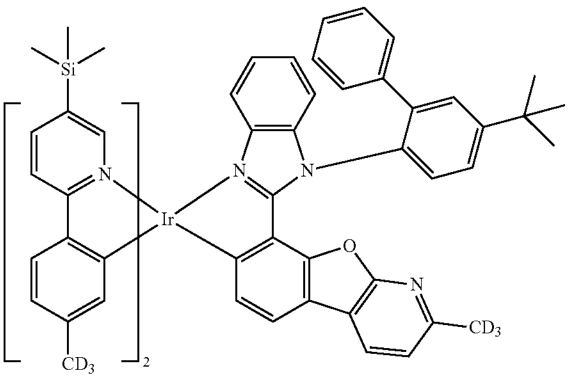
1191
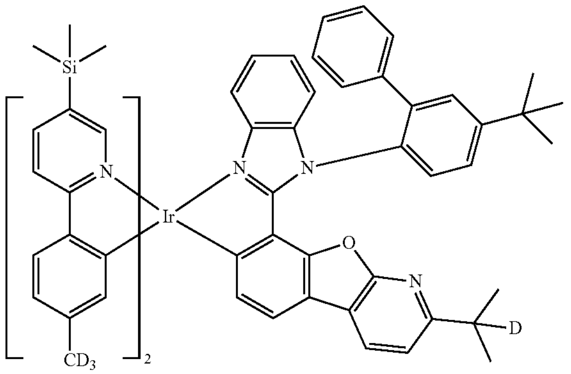
1192
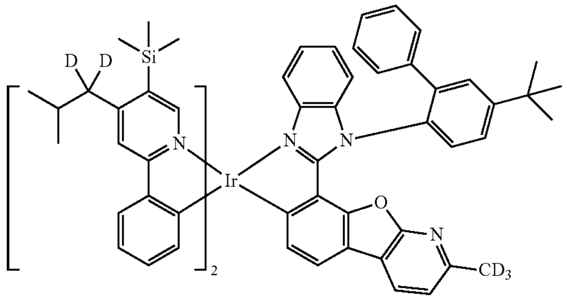
1193
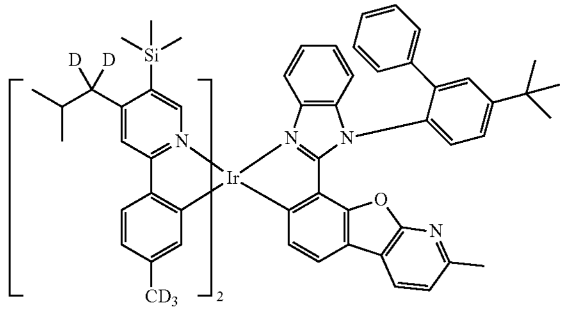

-continued
1194
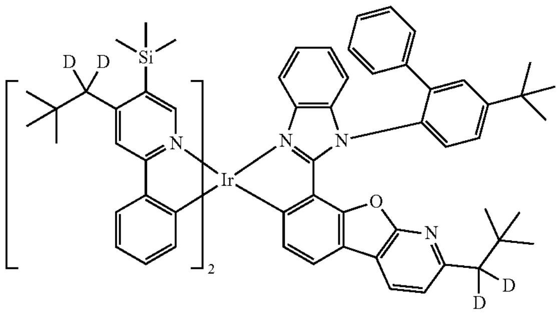
1195
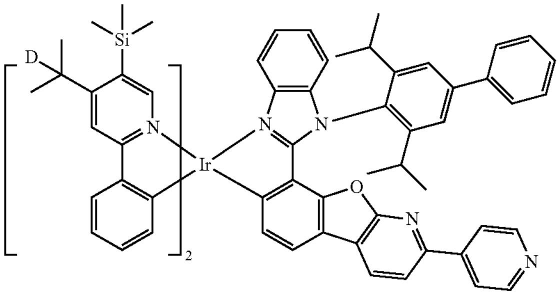
1196
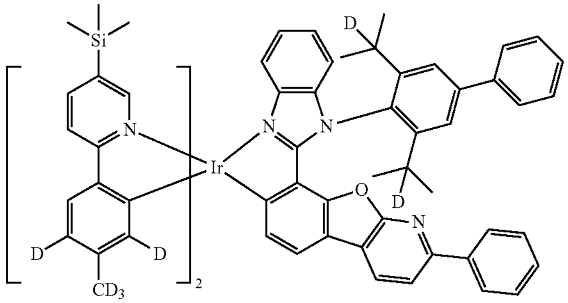
1197
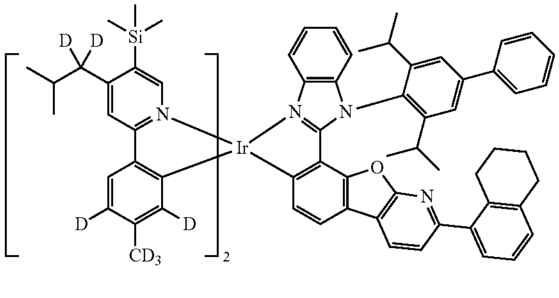
1198
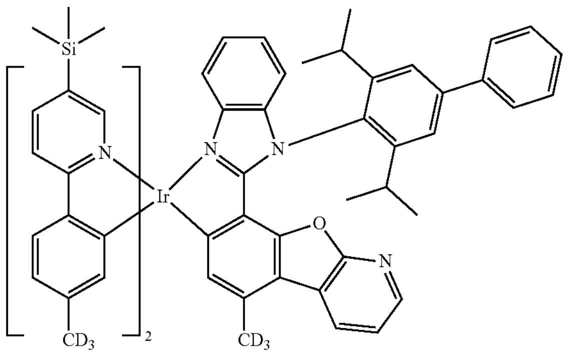
1199
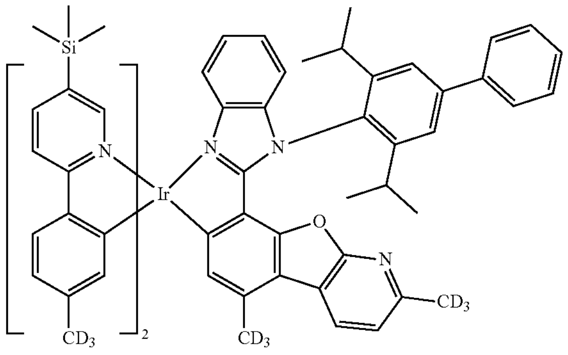
1200
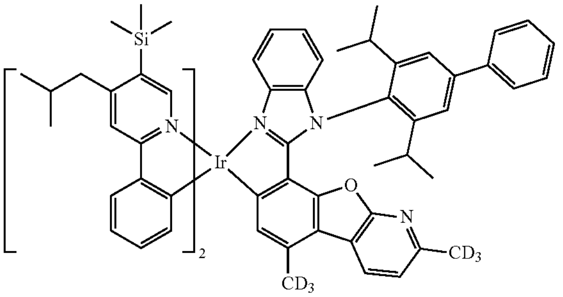
1201
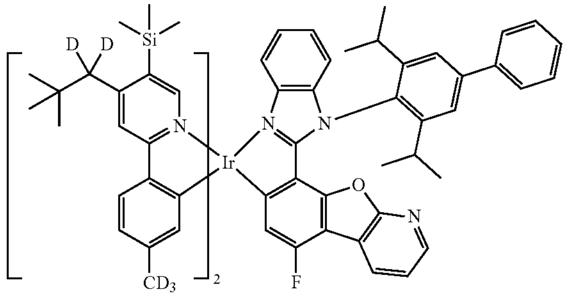

-continued
1202
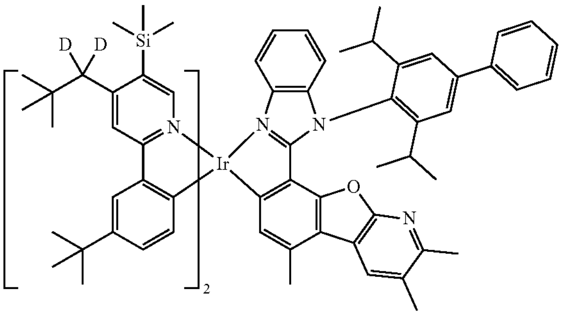
1203
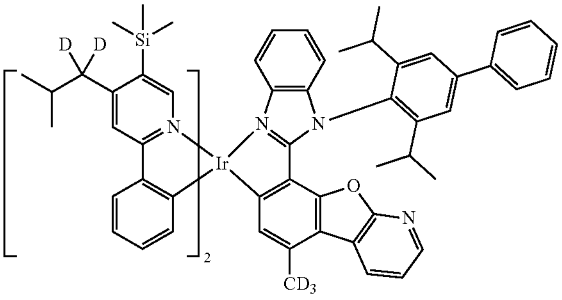
1204
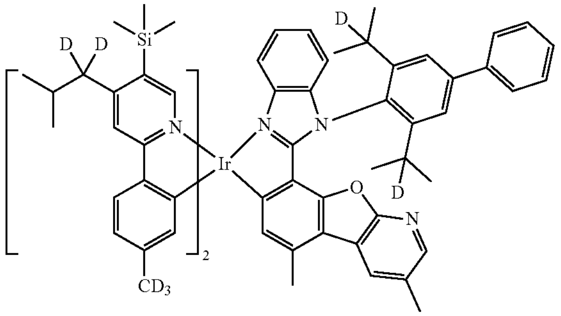
1205
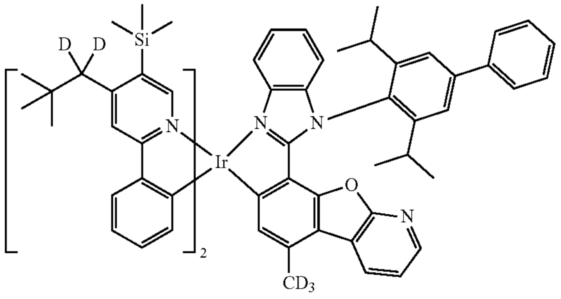
-continued
1206
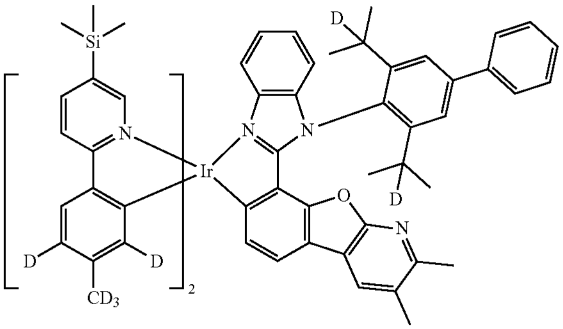
1207
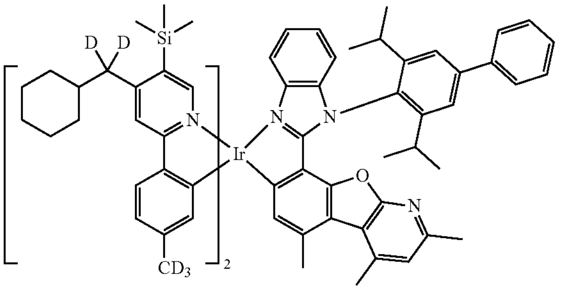
1208
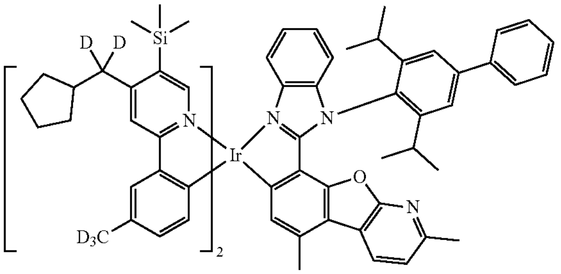
1209
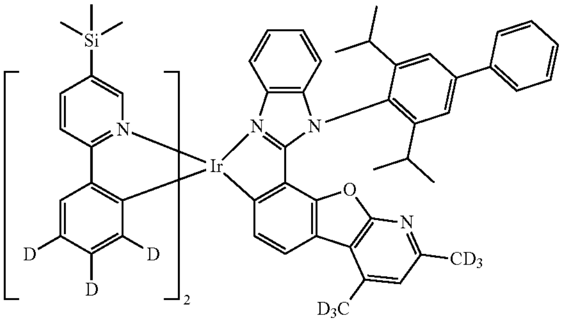
1210
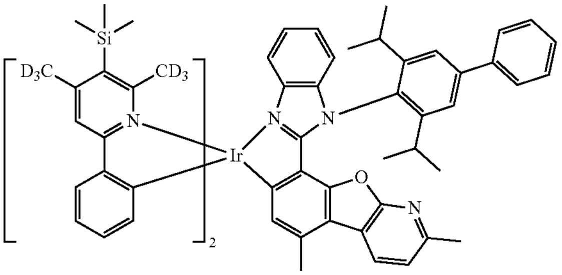

-continued
1211
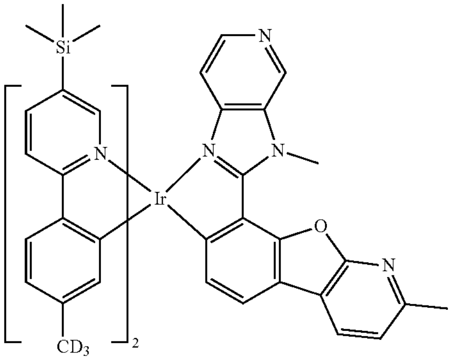
1212
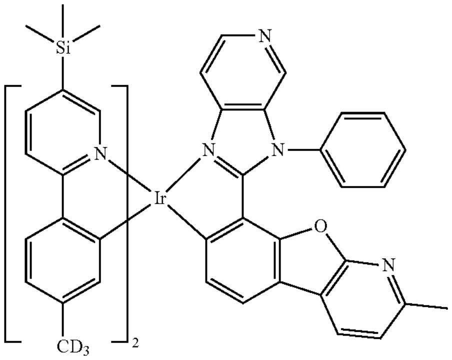
1213
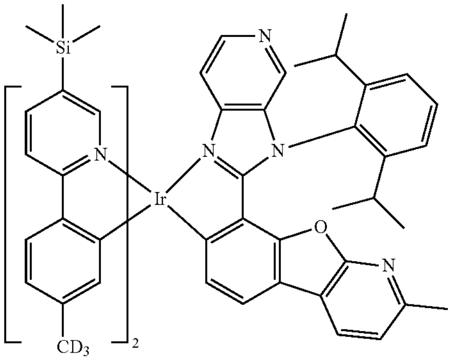
1214
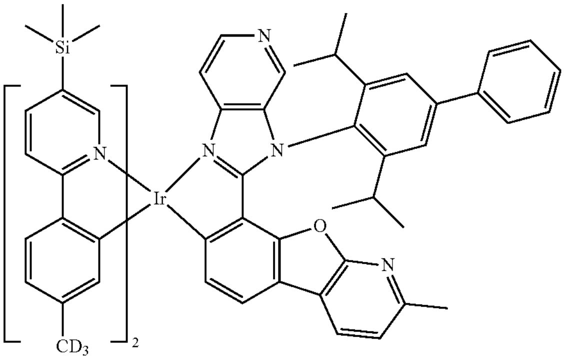
-continued
1215
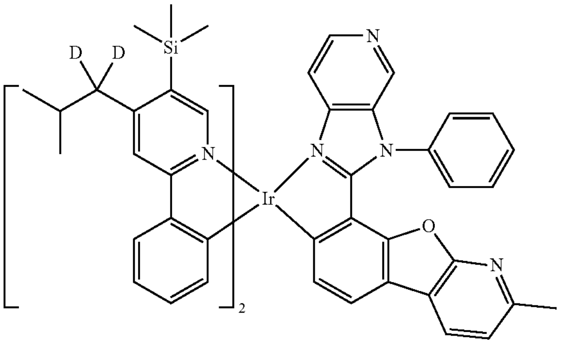
1216
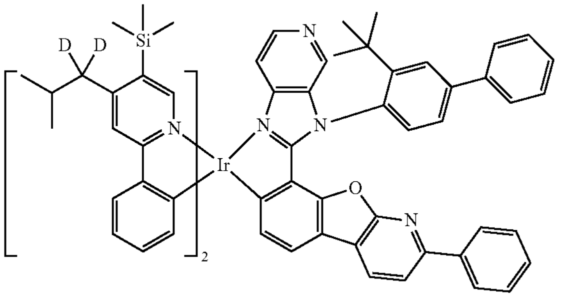
1217
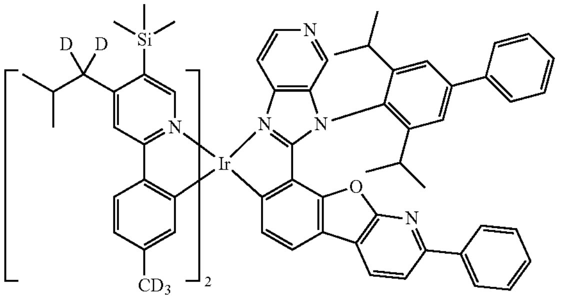
1218
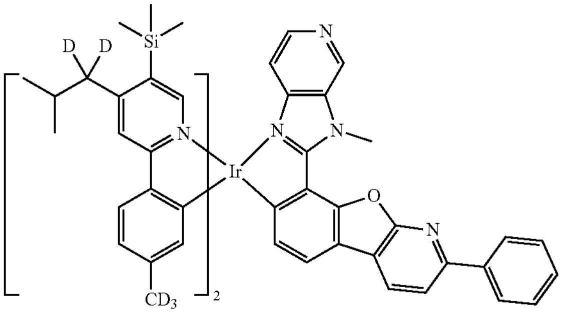

-continued
1219
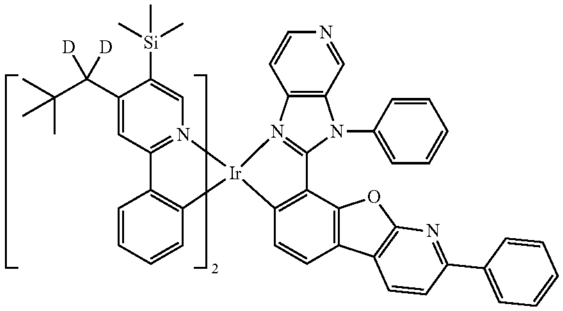
1220
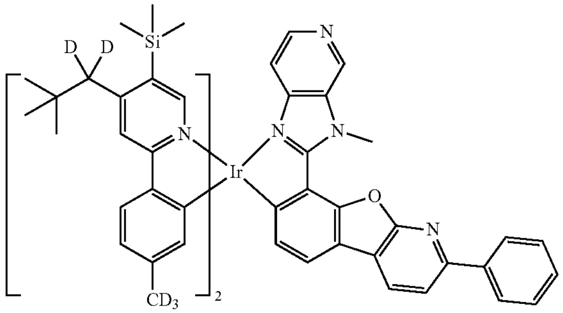
1221
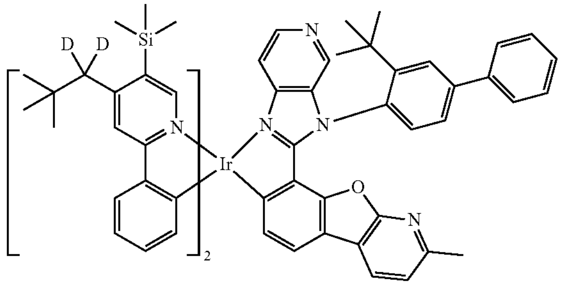
1222
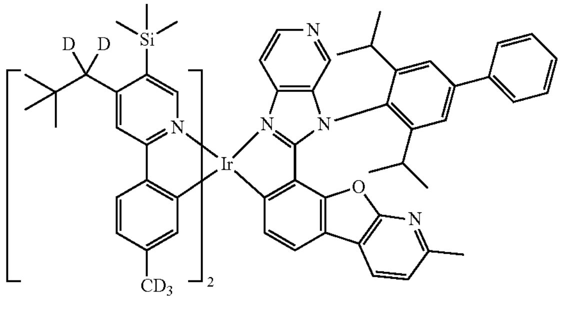
-continued
1223
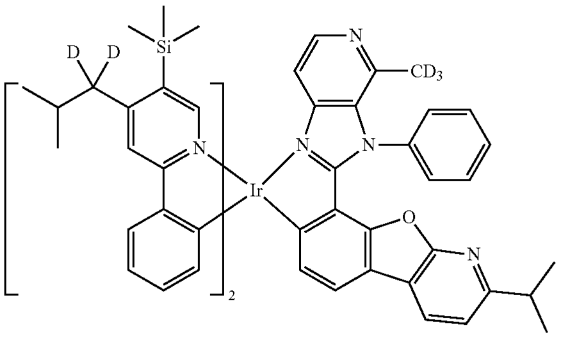
1224
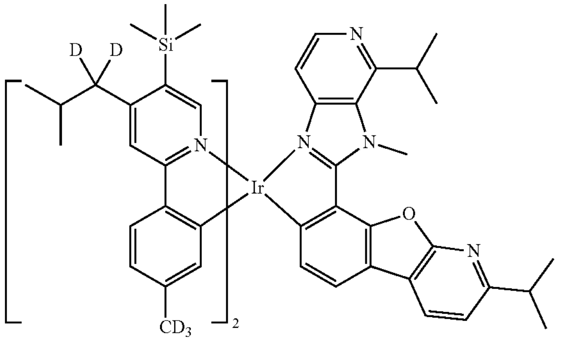
1225
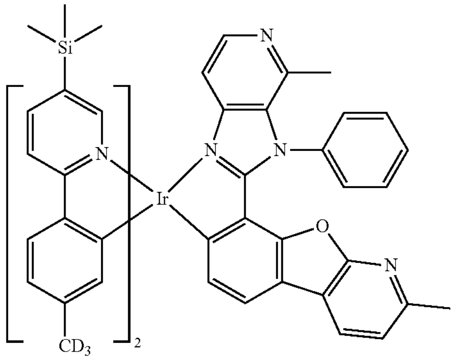
1226
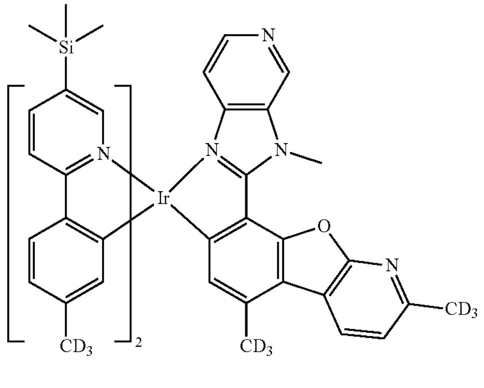

-continued
1227
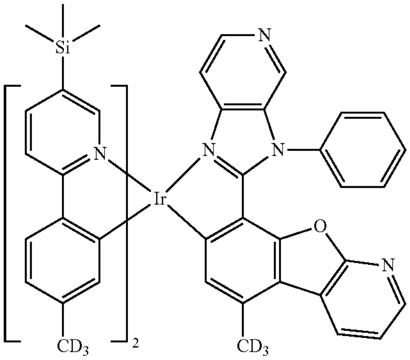
1228
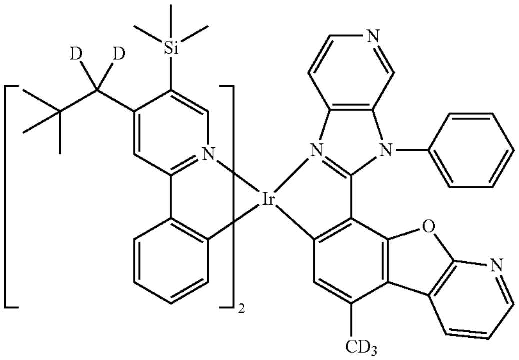
1229
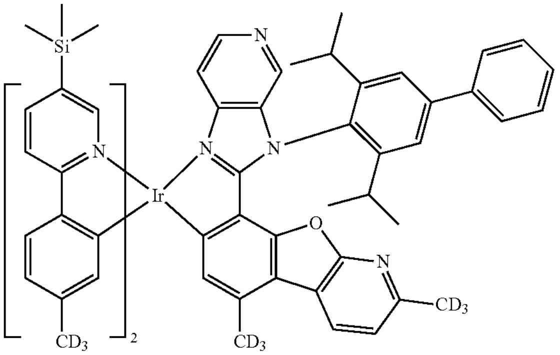
1230
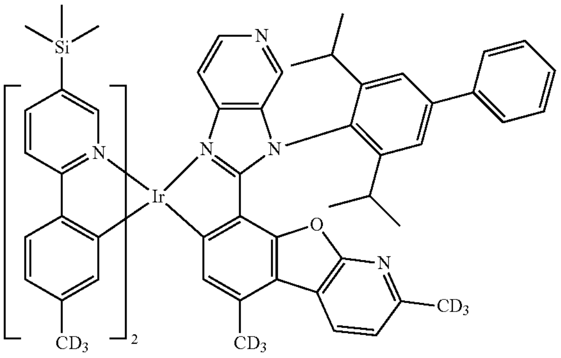
-continued
1231
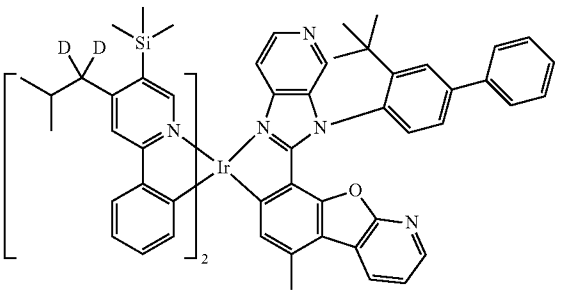
1232
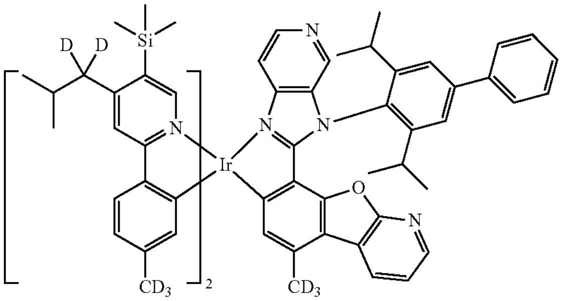
1233
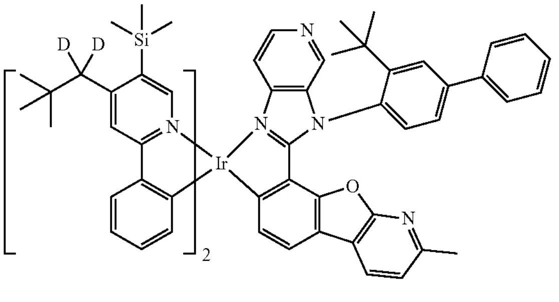
1234
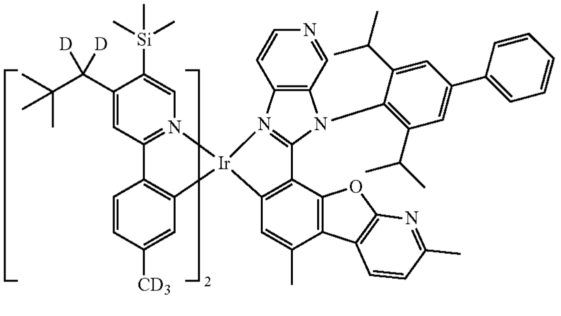

-continued
1235
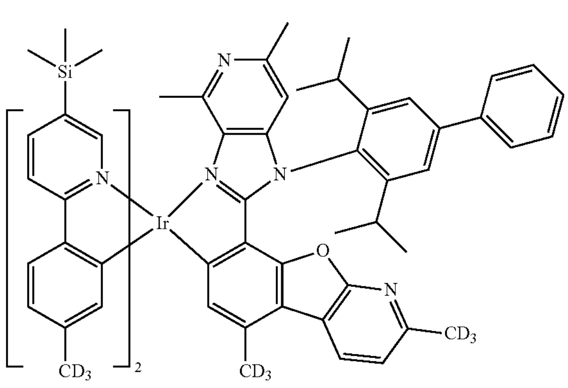
1236
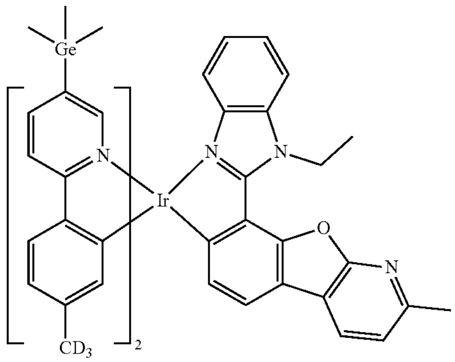
1237
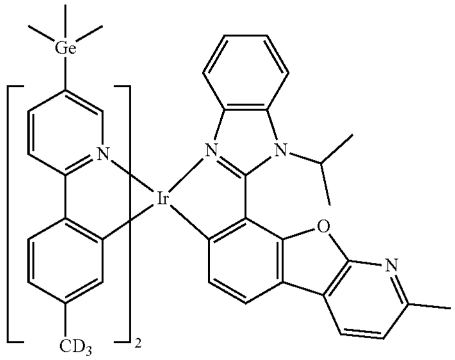
1238
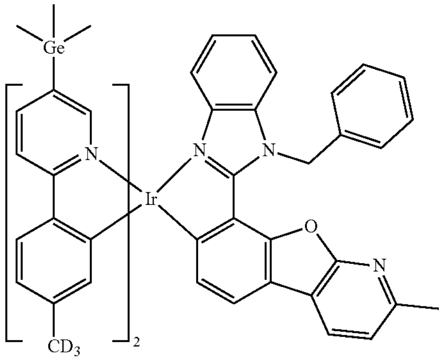
-continued
1239
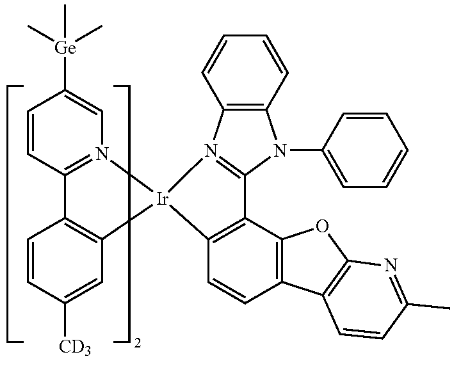
1240
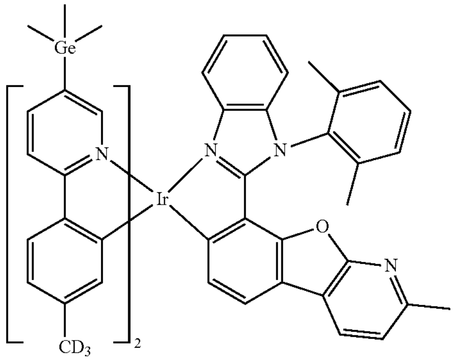
1241
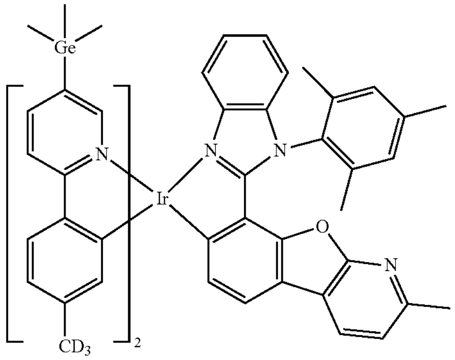
1242
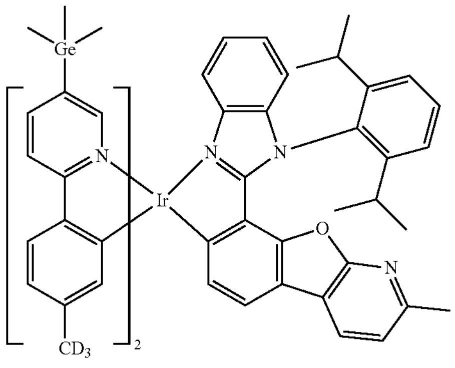

-continued
1243
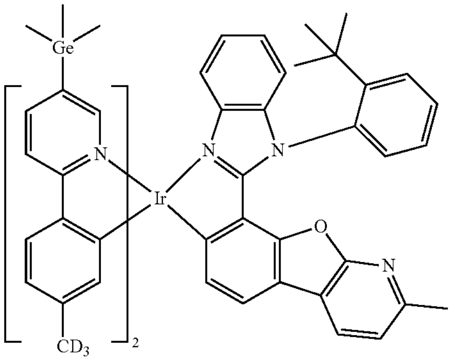
1244
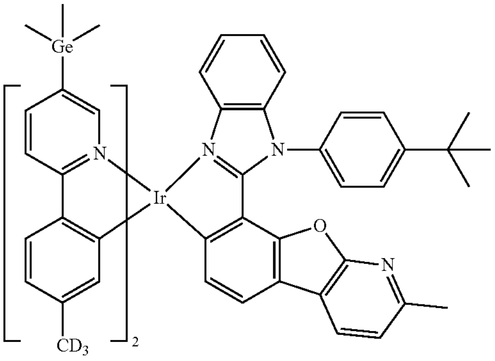
1245
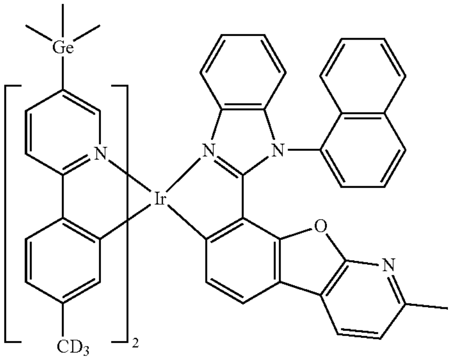
1246
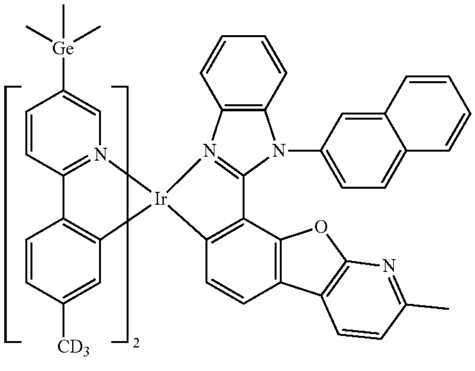
-continued
1247
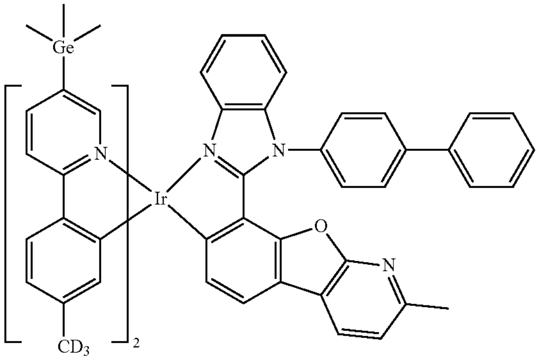
1248
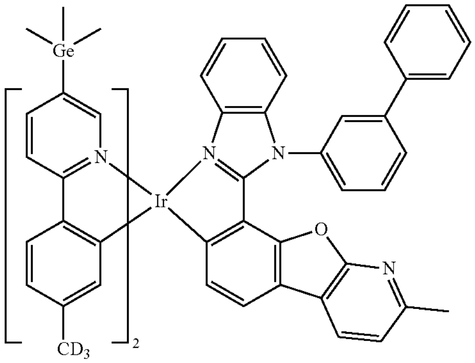
1249
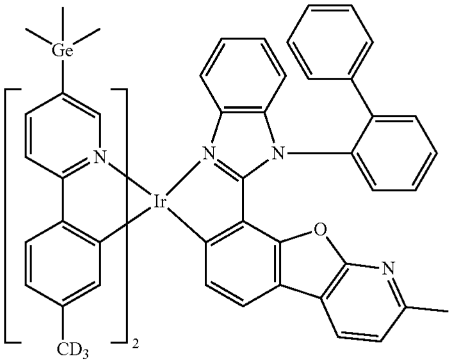
1250
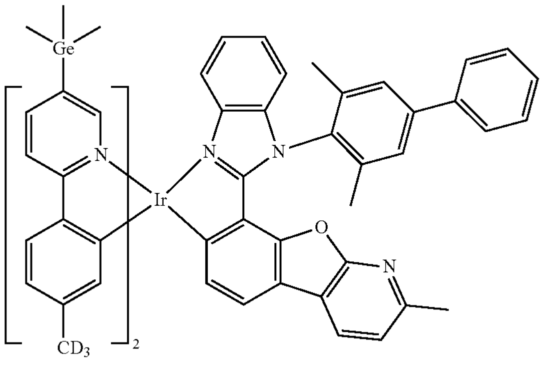

-continued
1251
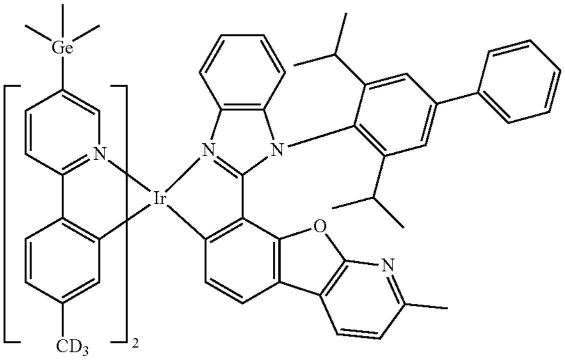
1252
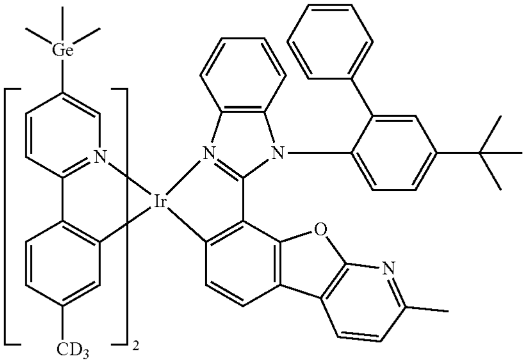
1253
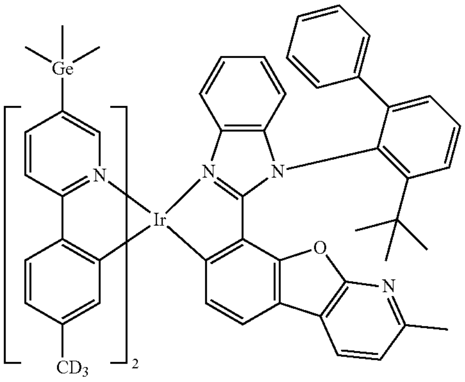
1254
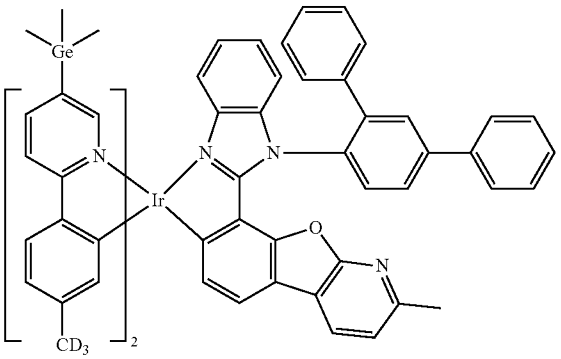
-continued
1255
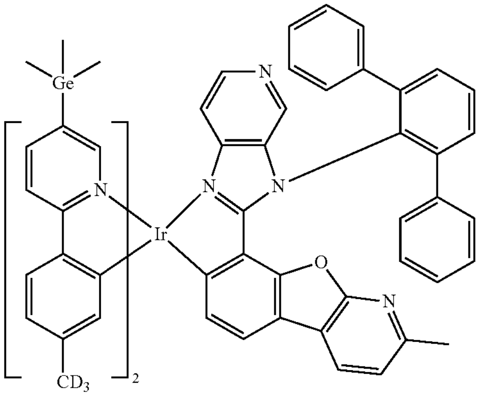
1256
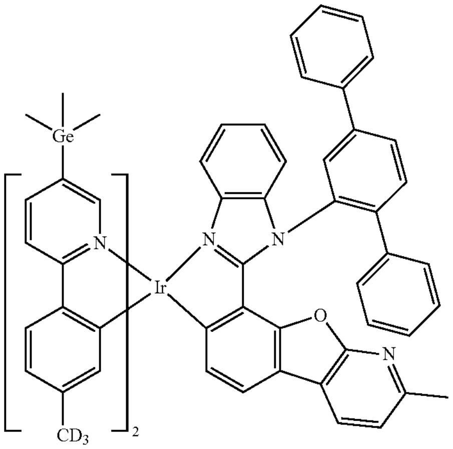
1257
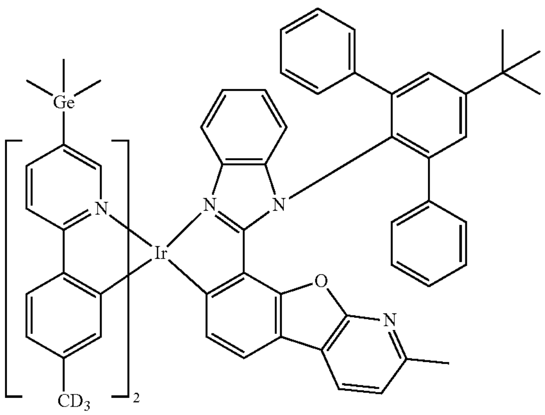

-continued
1258
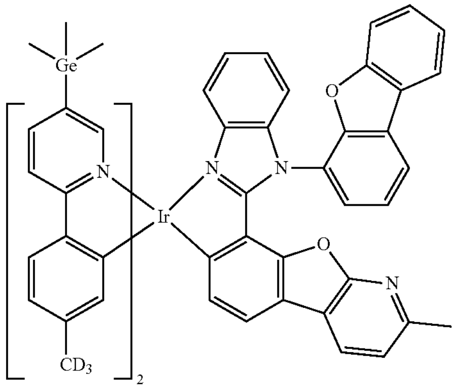
1259
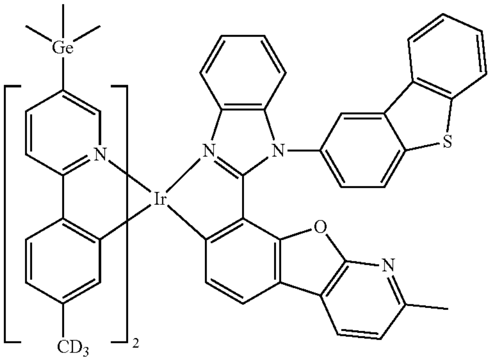
1260
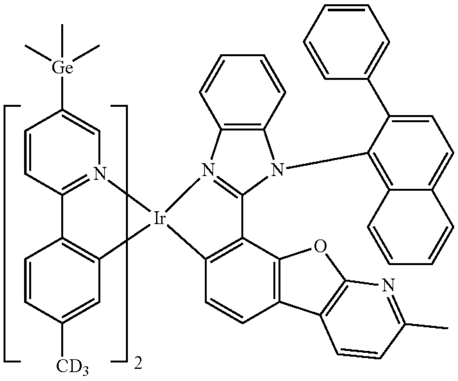
1261
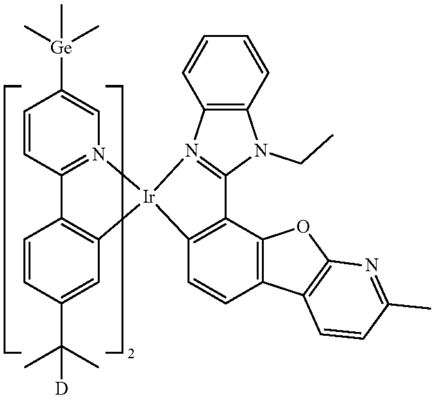
-continued
1262
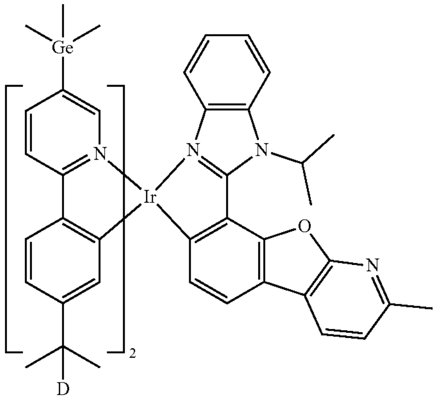
1263
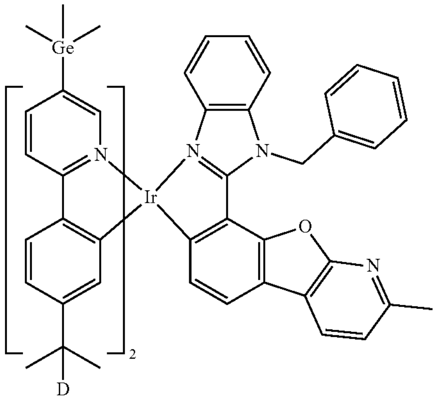
1264
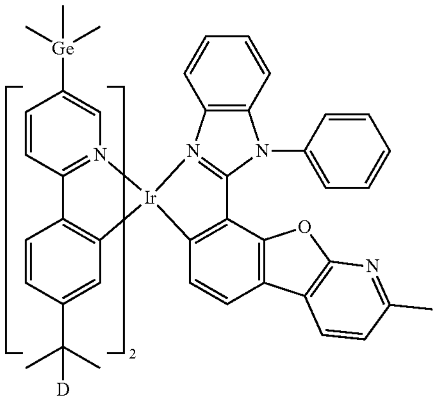
1265
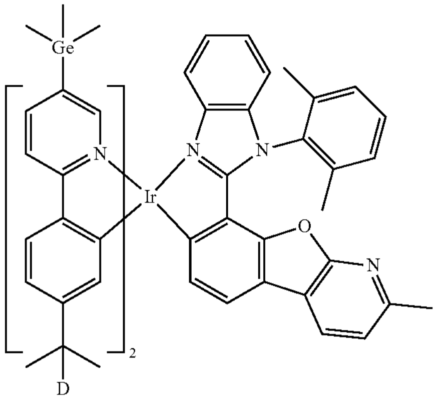

-continued
1266
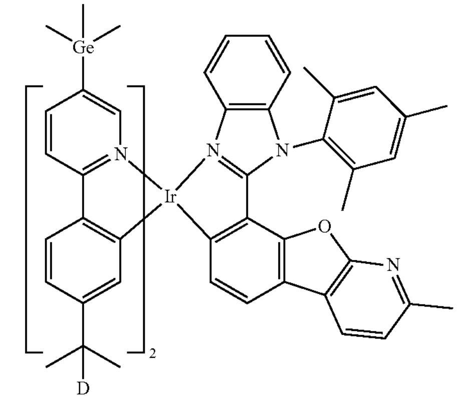
1267
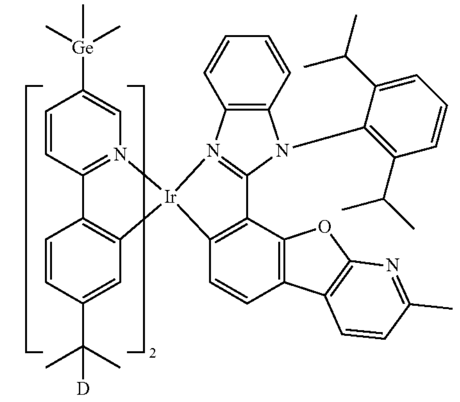
1268
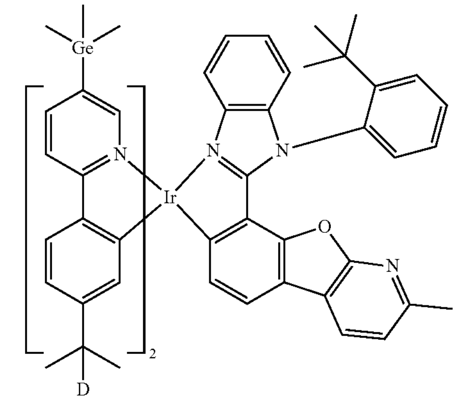
1269
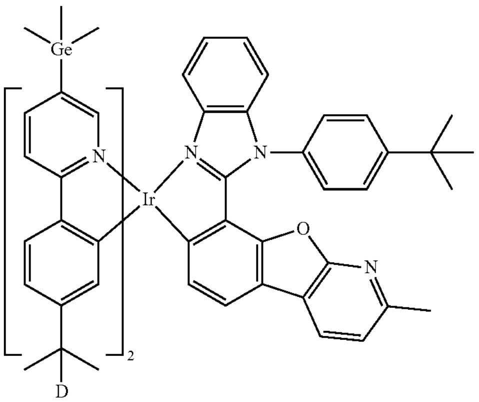
-continued
1270
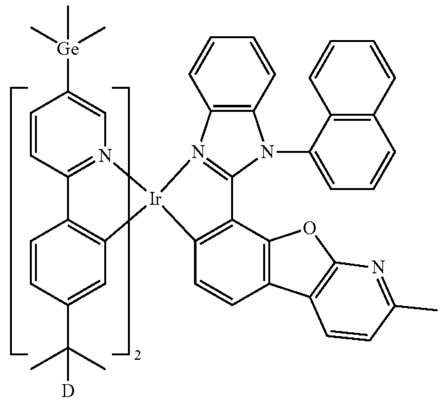
1271
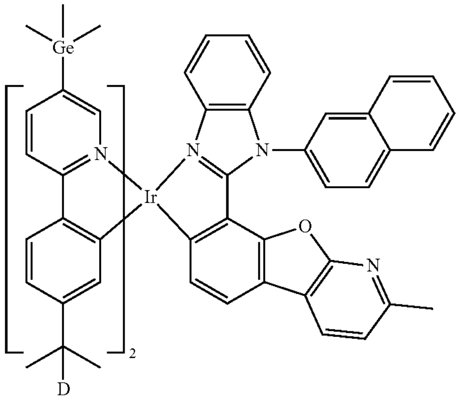
1272
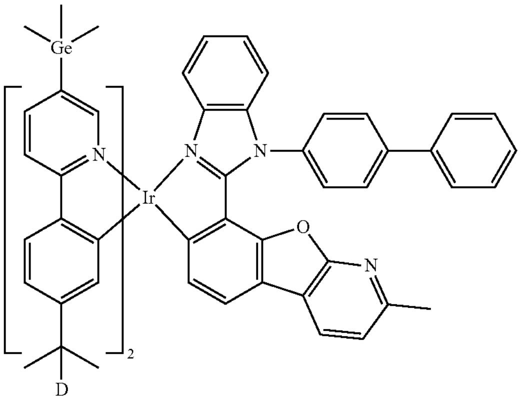
1273
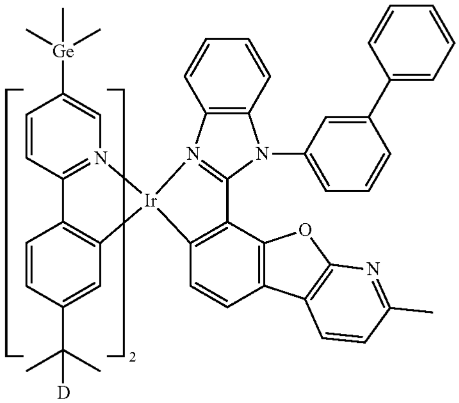

-continued
1274
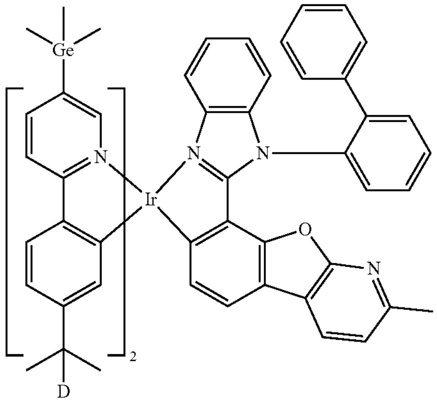
1275
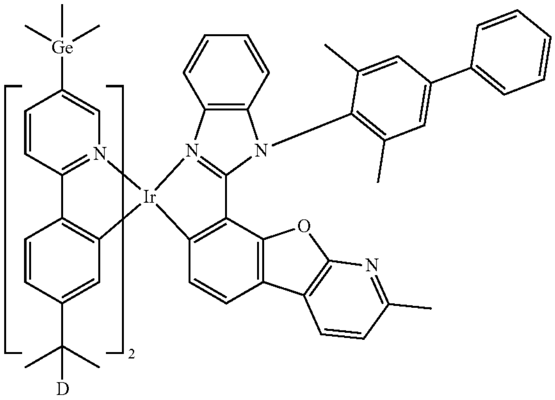
1276
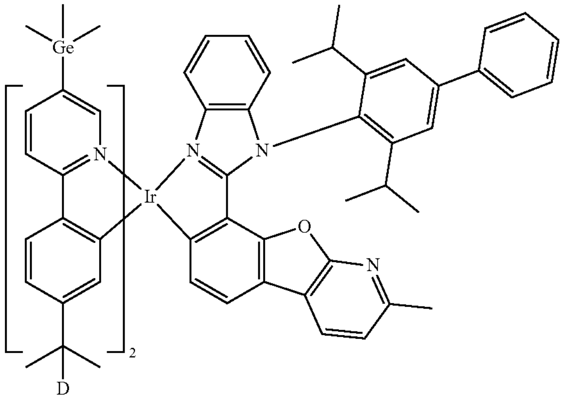
-continued
1277
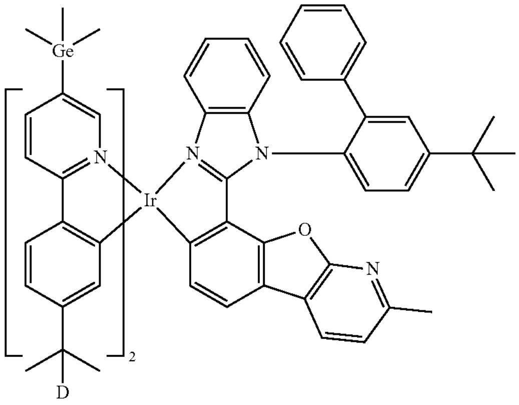
1278
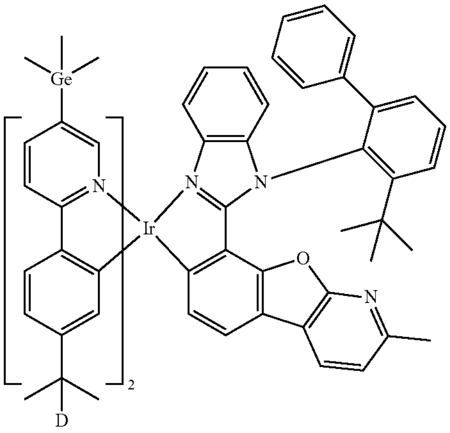
1279
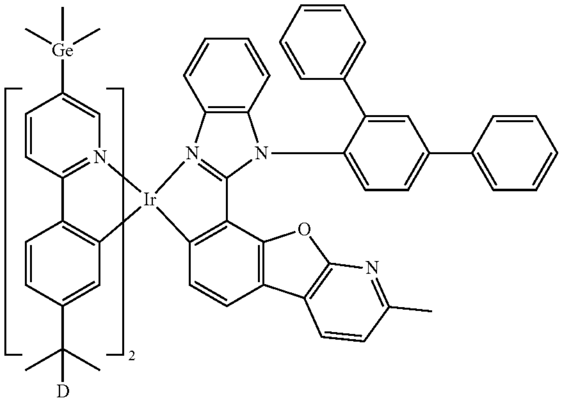

-continued
1280
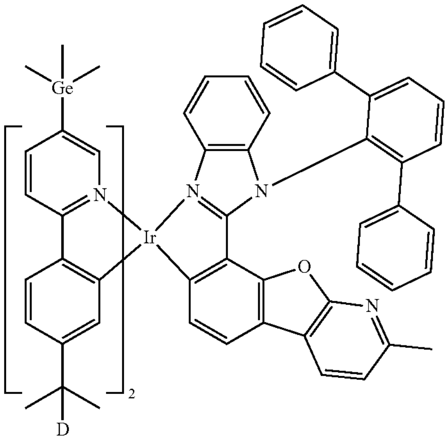
1281
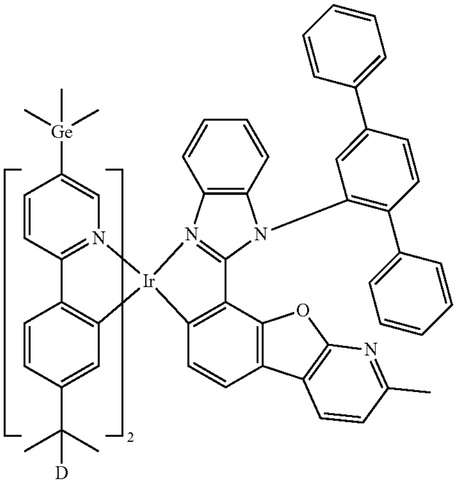
1282
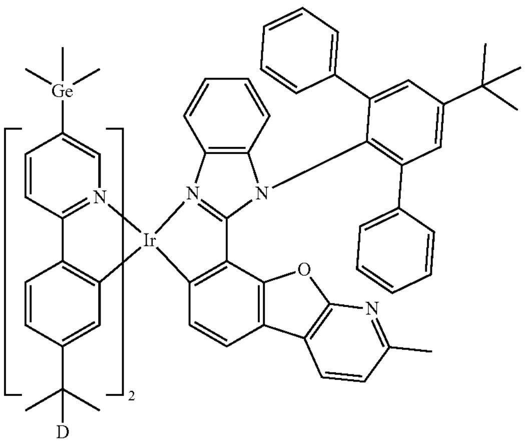
-continued
1283
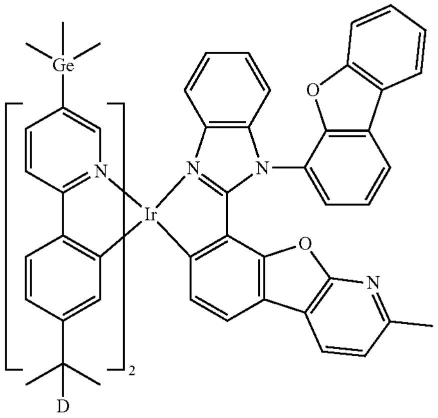
1284
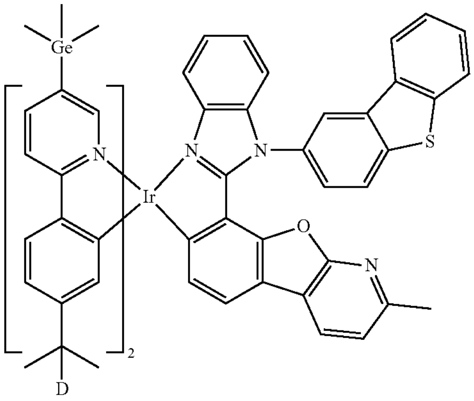
1285
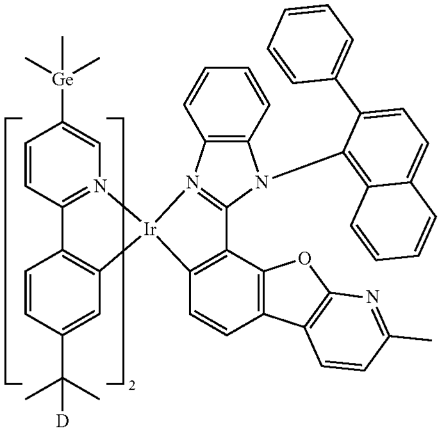
1286
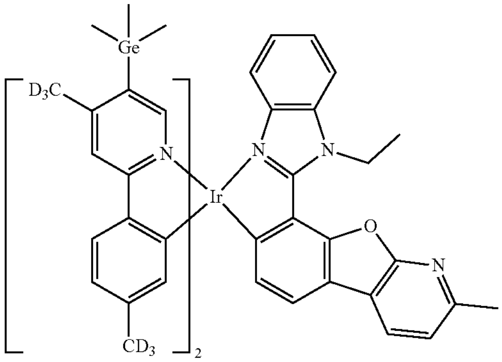

-continued
1287
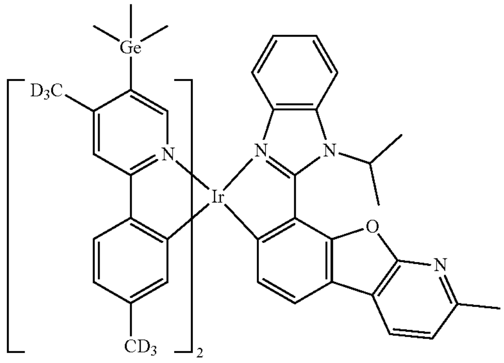
1288
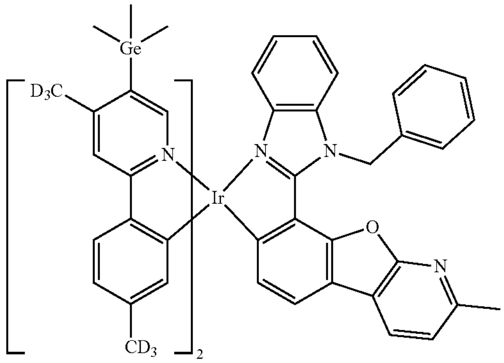
1289
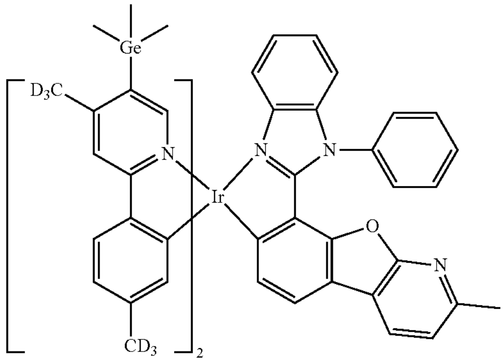
1290
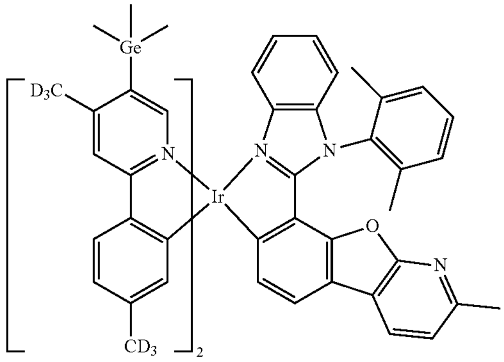
-continued
1291
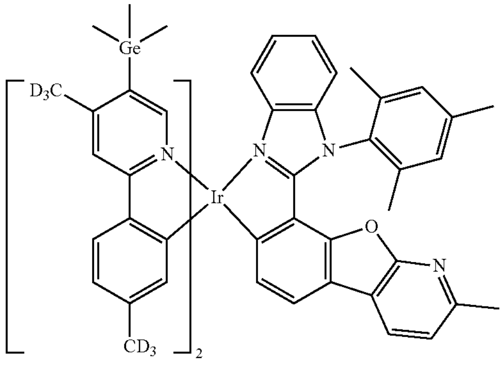
1292
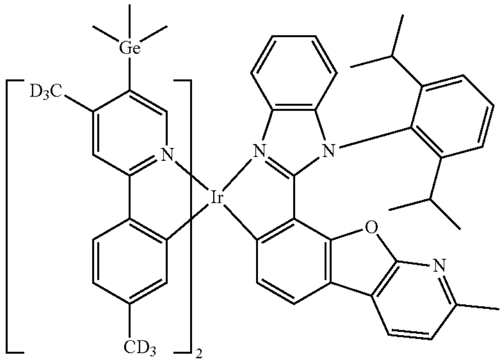
1293
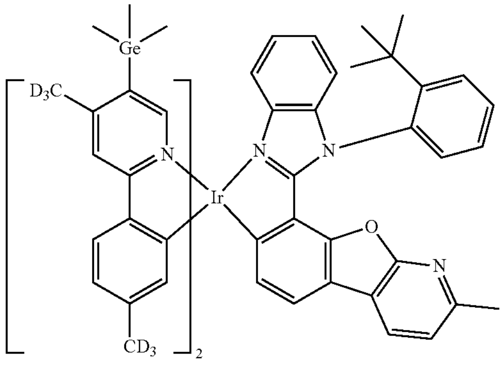
1294
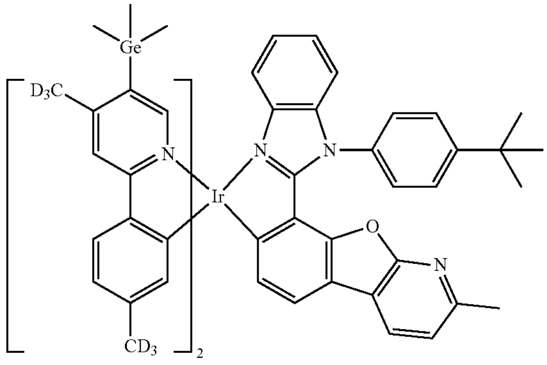

-continued
1295
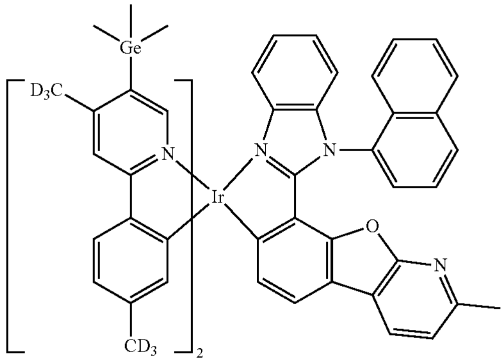
1296
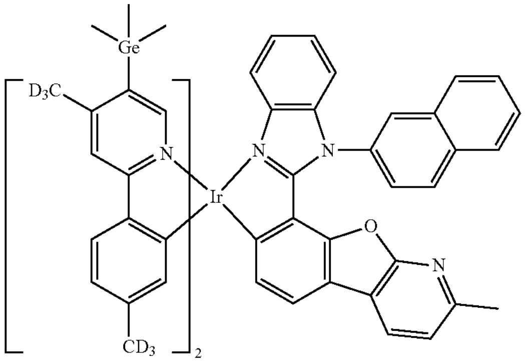
1297
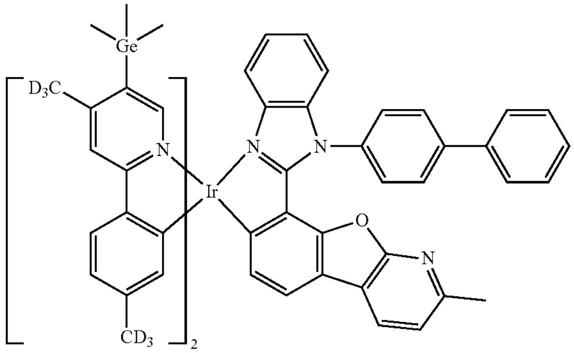
1298
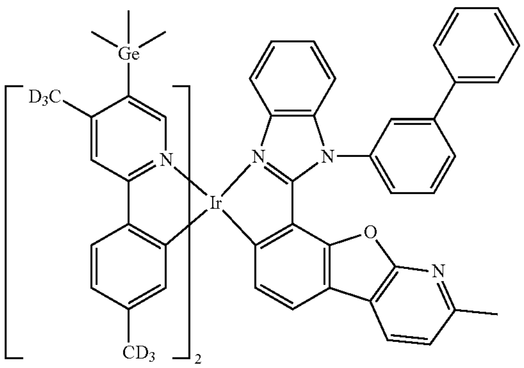
-continued
1299
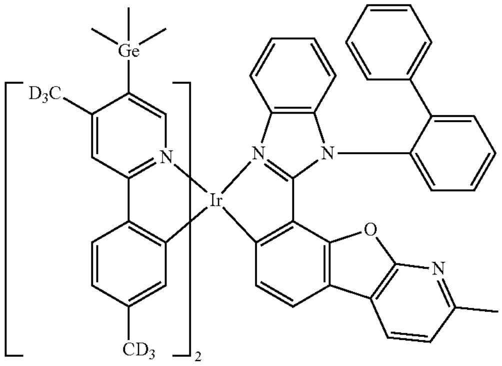
1300
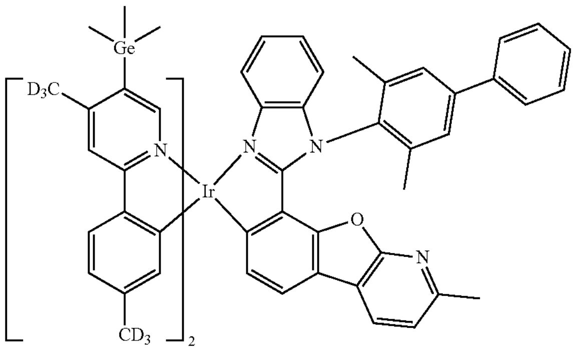
1301
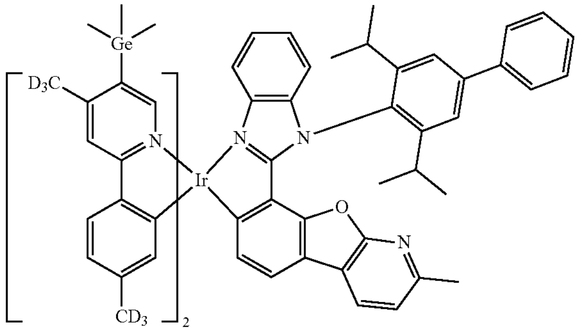
1302
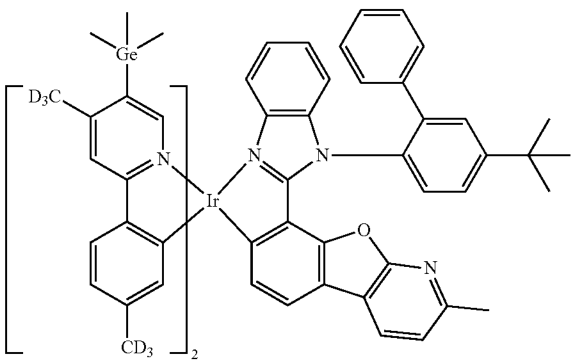

-continued
1303
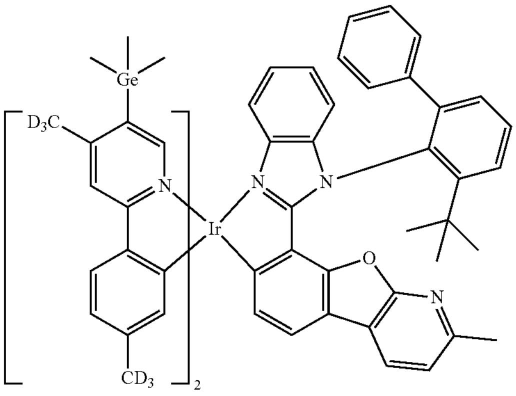
1304
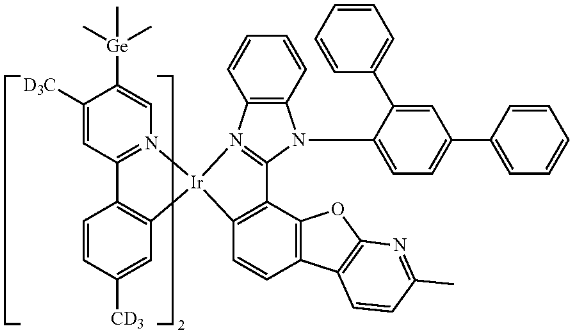
1305
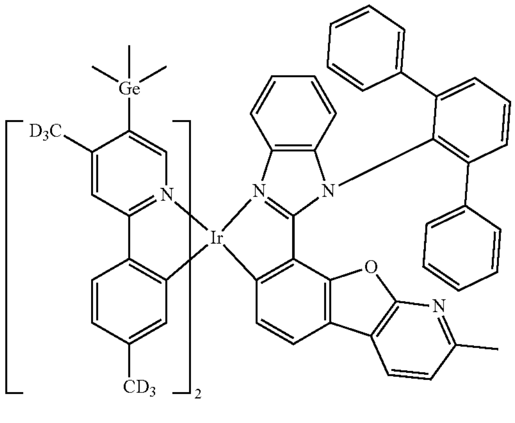
1306
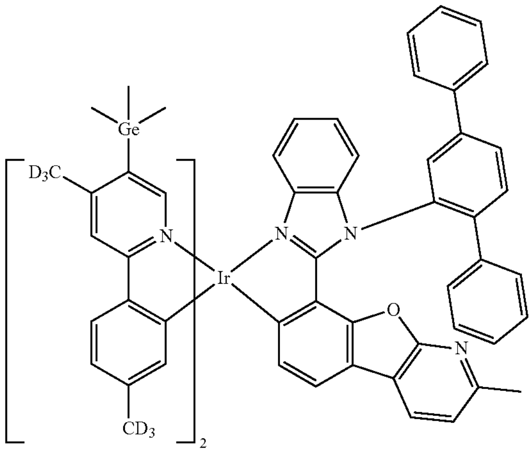
1307
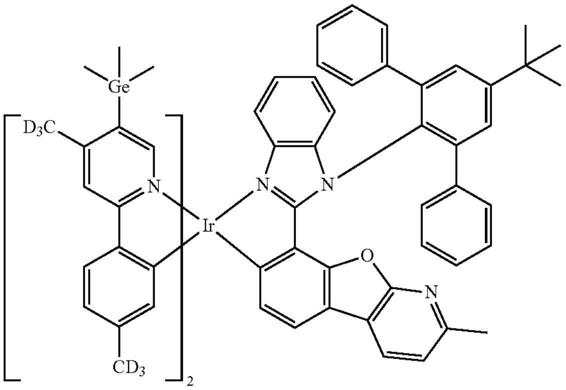
1308
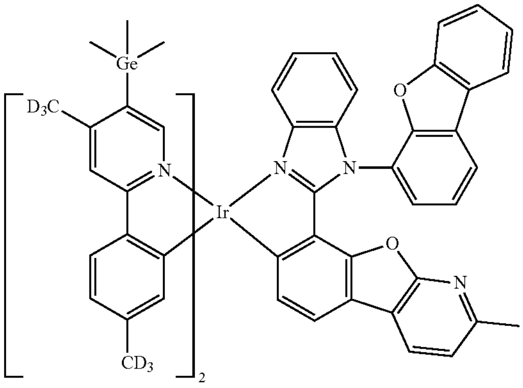

-continued
1309
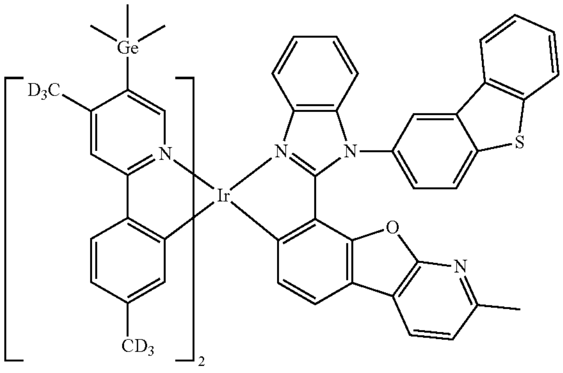
1310
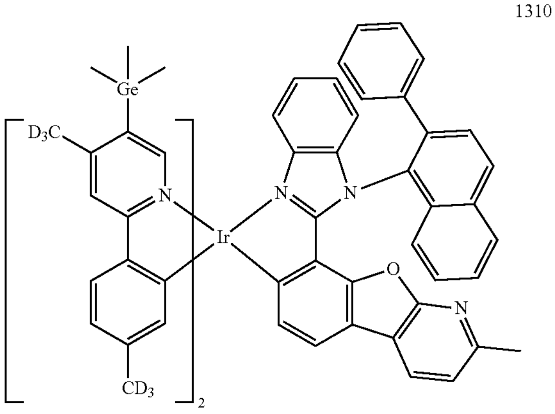
1311
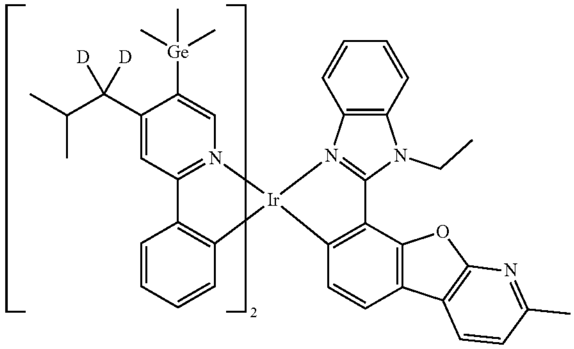
1312
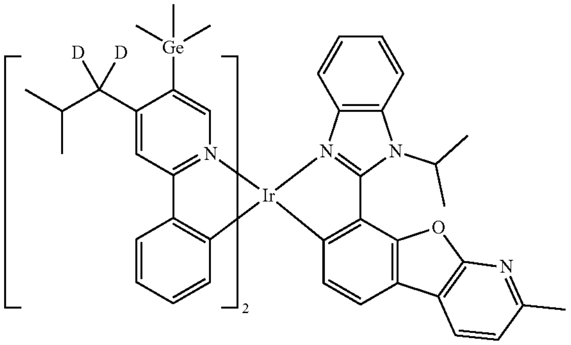
-continued
1313
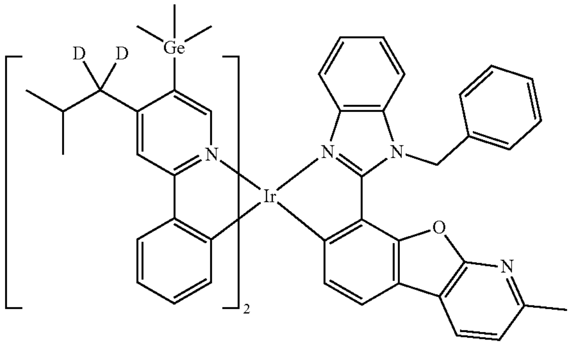
1314
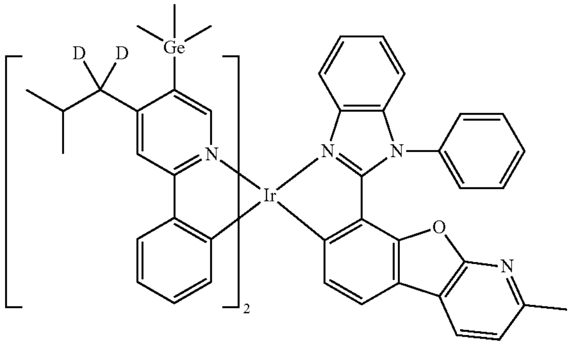
1315
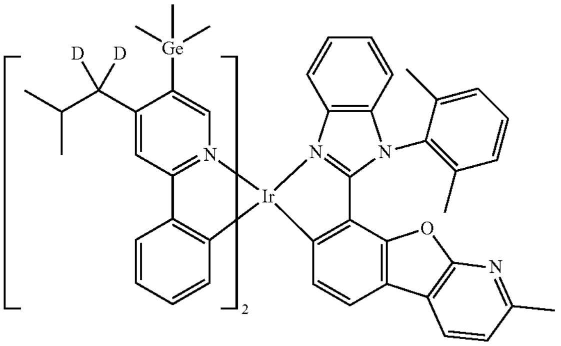
1316
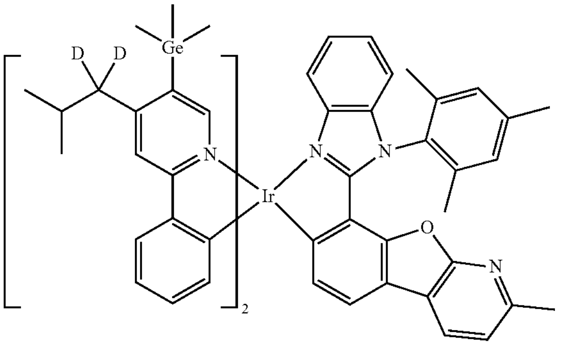

-continued
1317
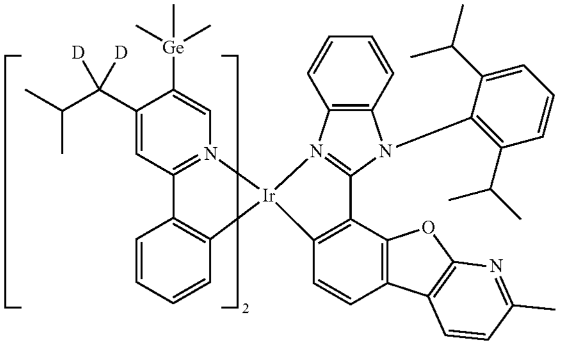
1318
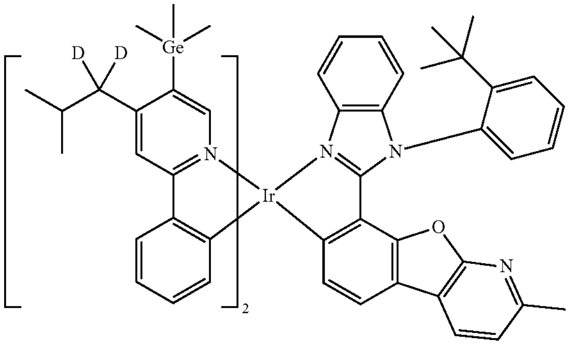
1319
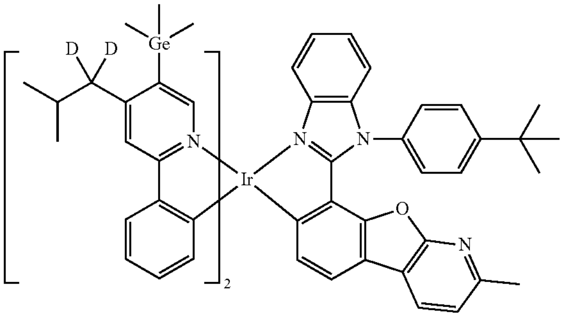
1320
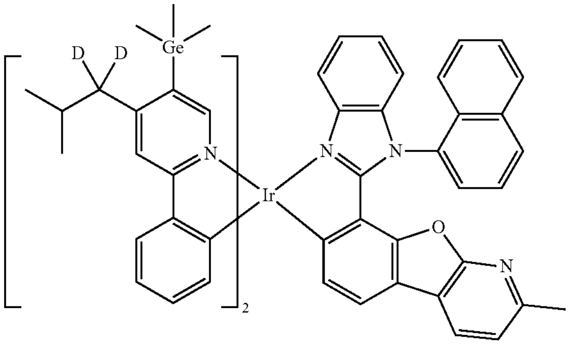
-continued
1321
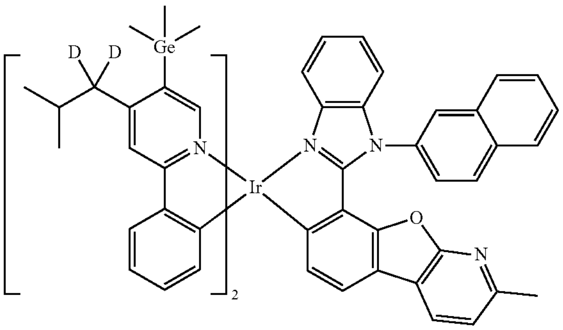
1322
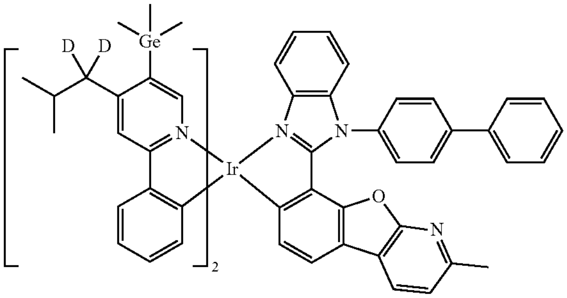
1323
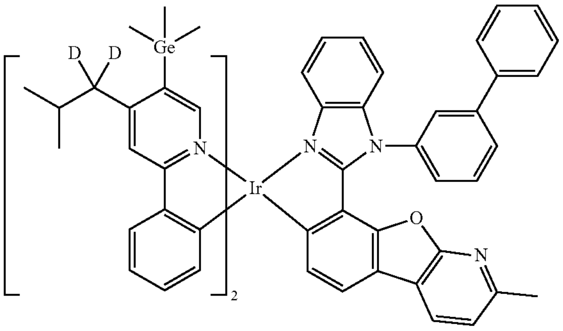
1324
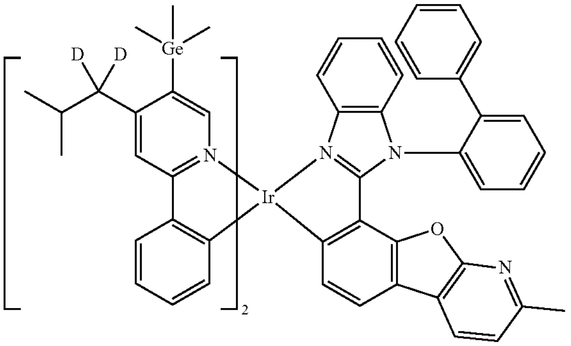

-continued
1325
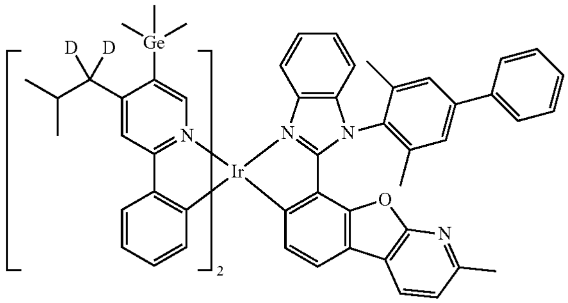
1326
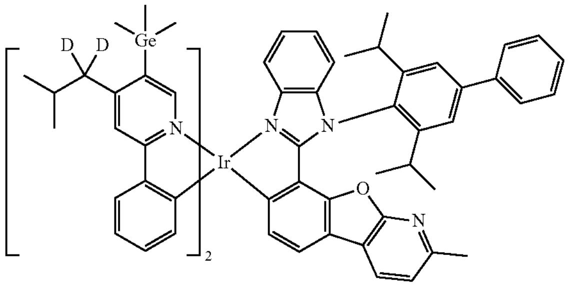
1327
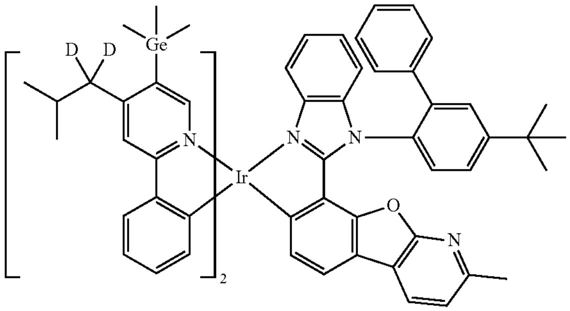
1328
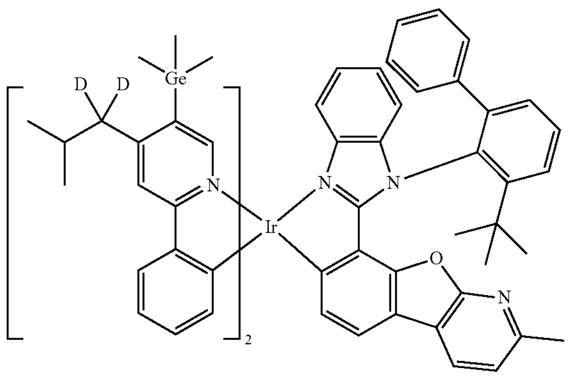
-continued
1329
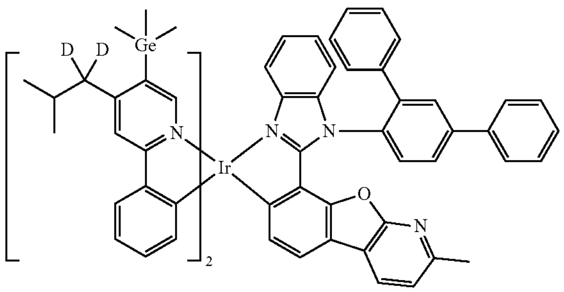
1330
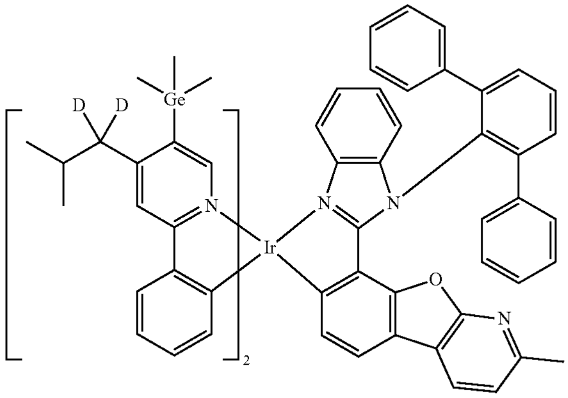
1331
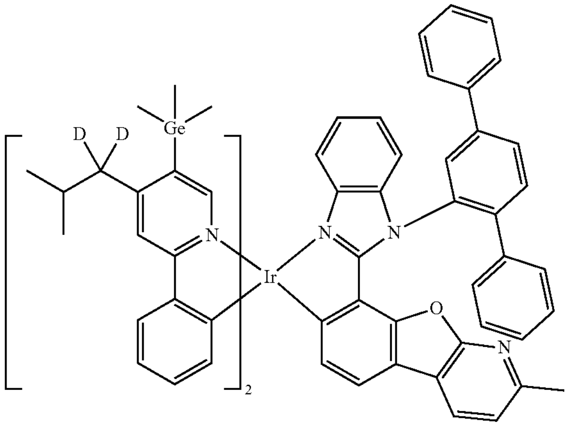
1332
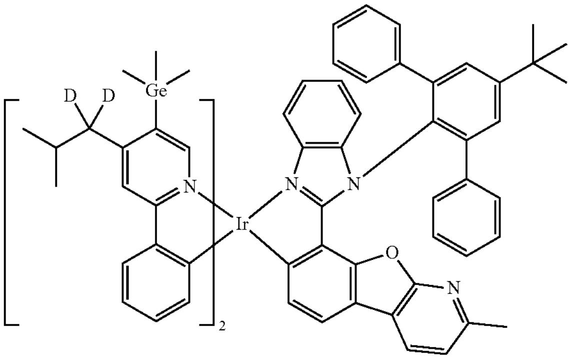

-continued
1333
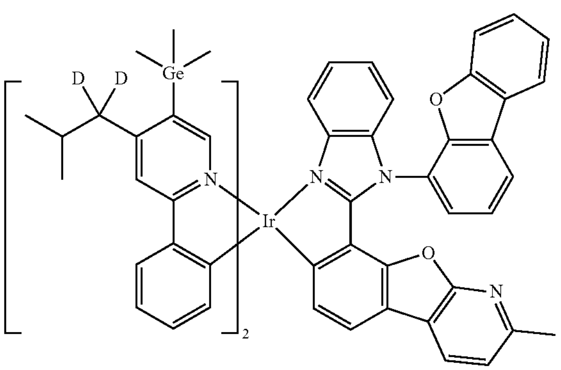
1334
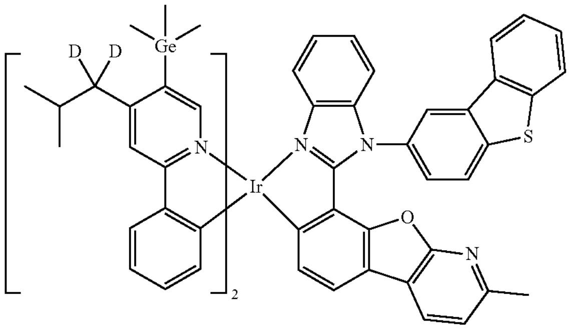
1335
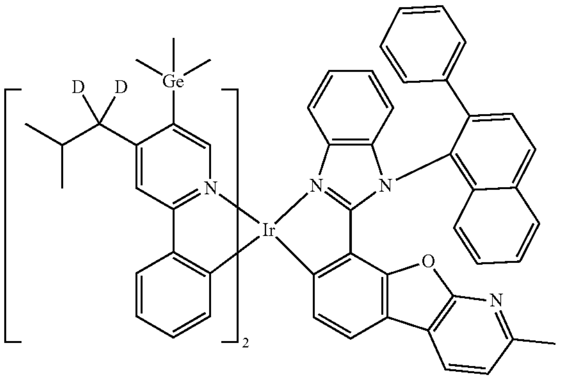
1336
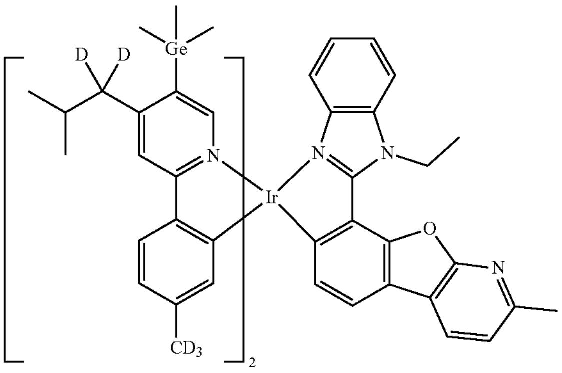
-continued
1337
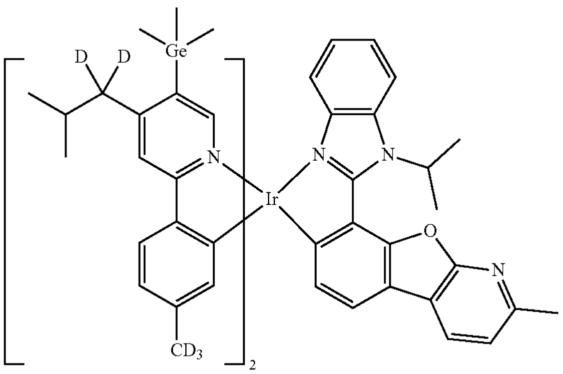
1338
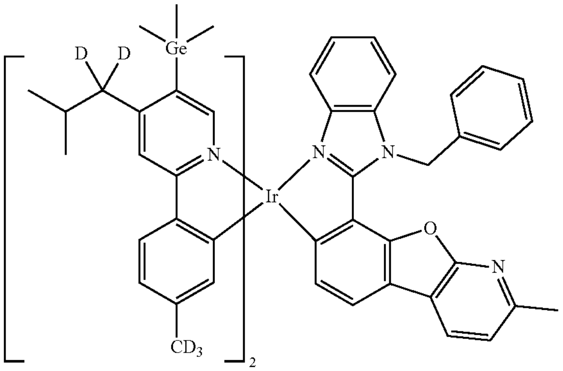
1339
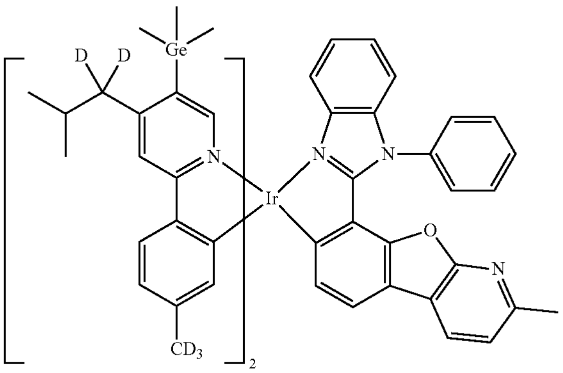
1340
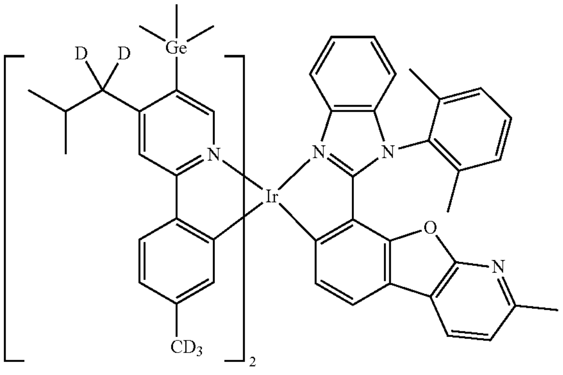

-continued
1341
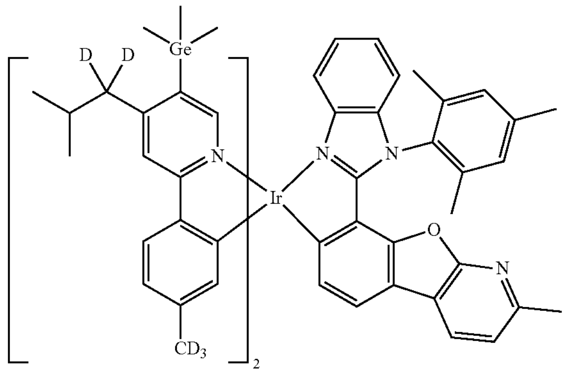
1342
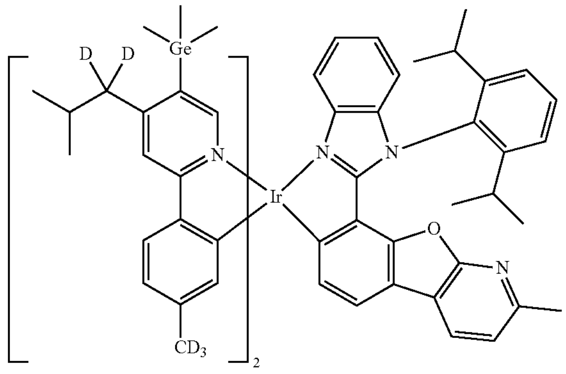
1343
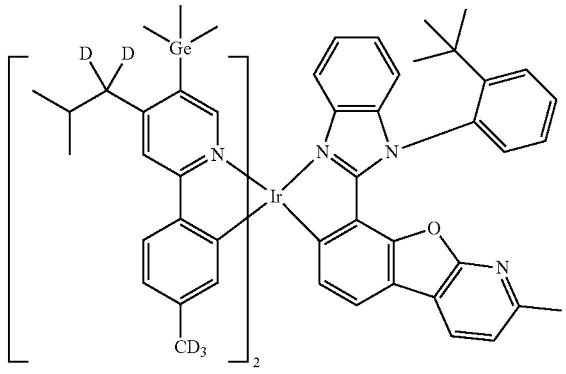
1344
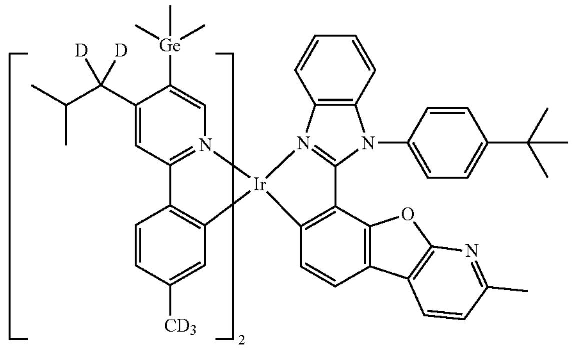
-continued
1345
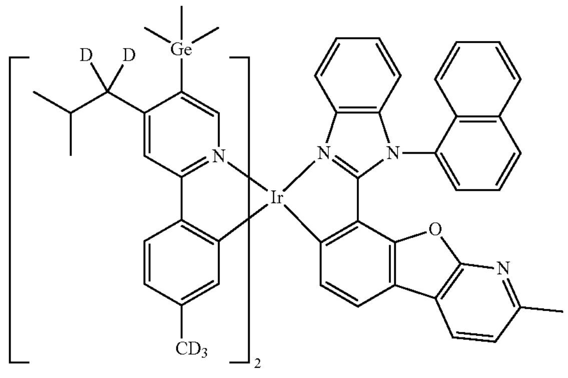
1346
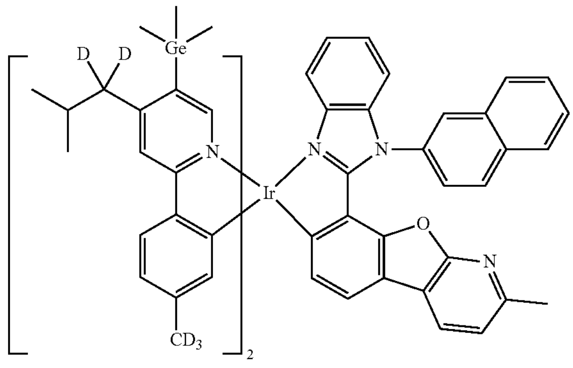
1347
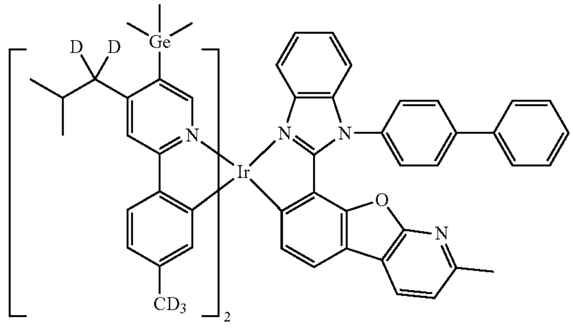
1348
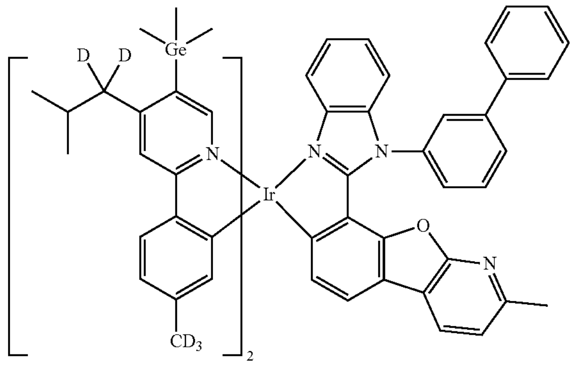

-continued
1349
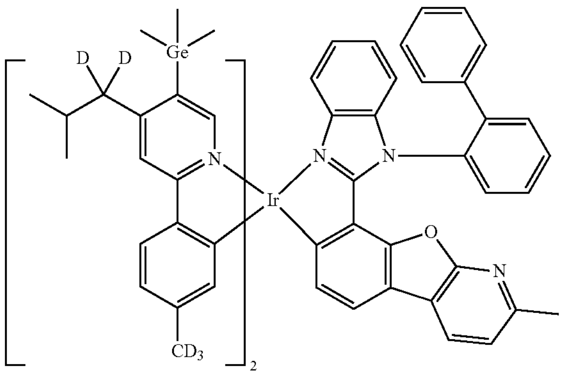
1350
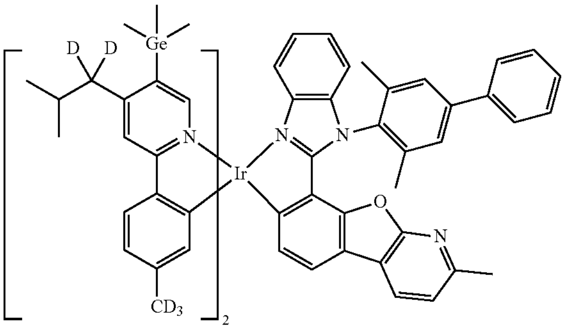
1351
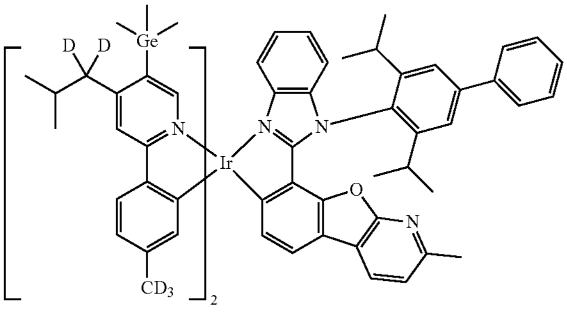
1352
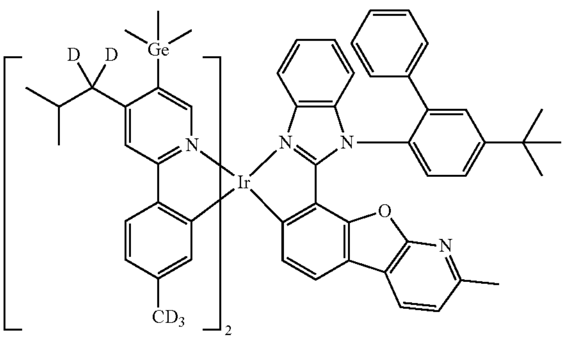
-continued
1353
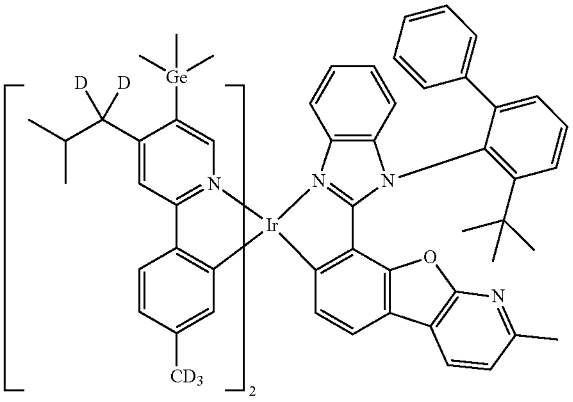
1354
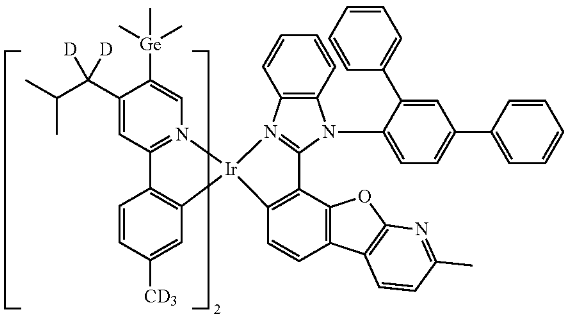
1355
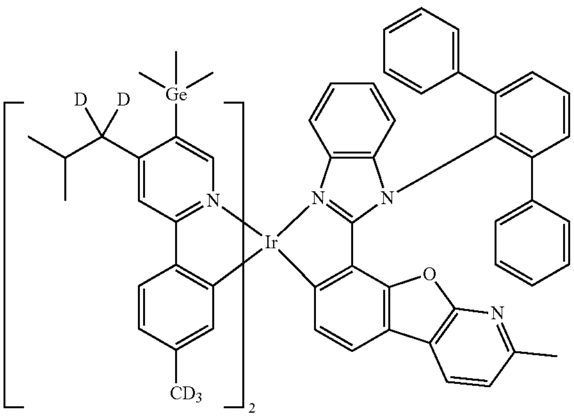

-continued
1356
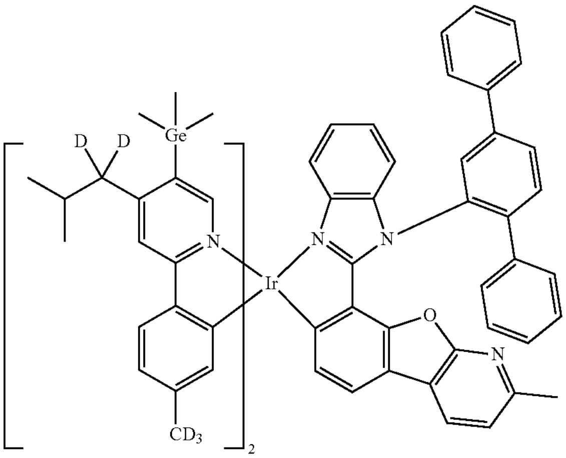
1357
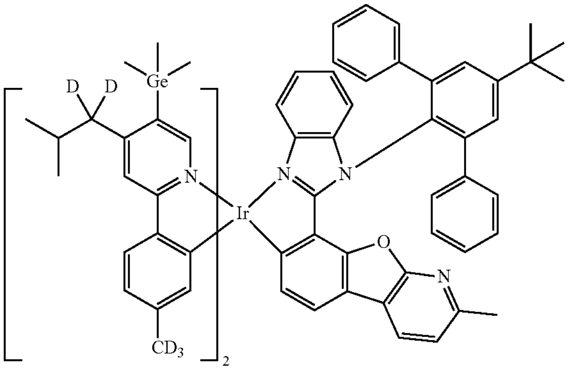
1358
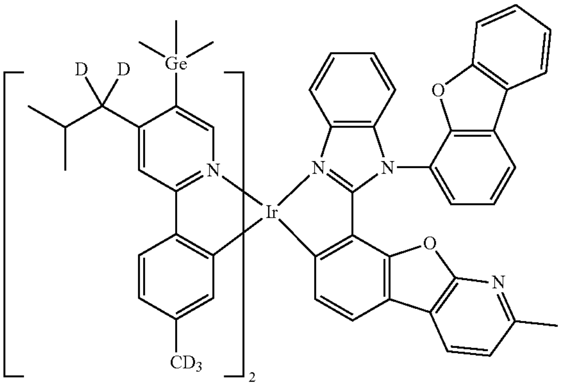
-continued
1359
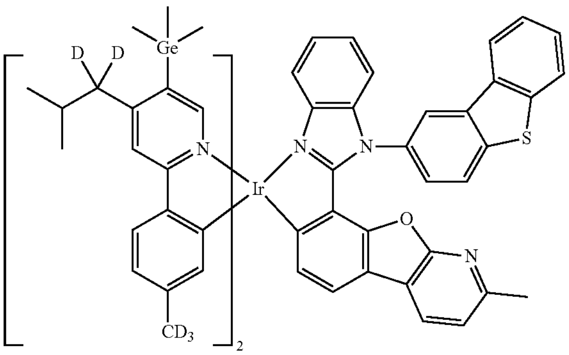
1360
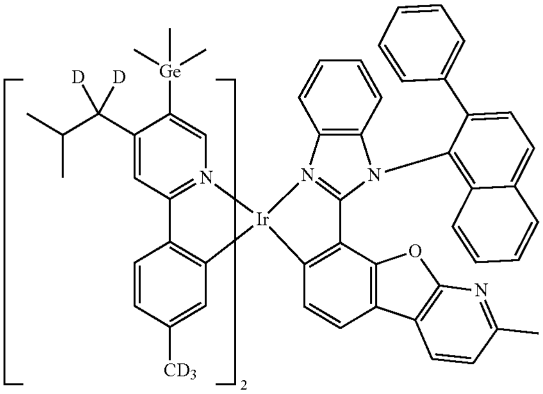
1361
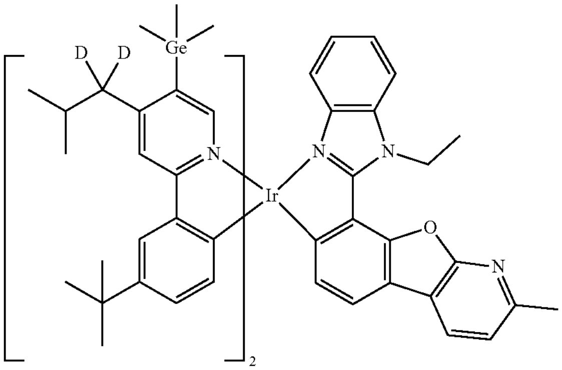
1362
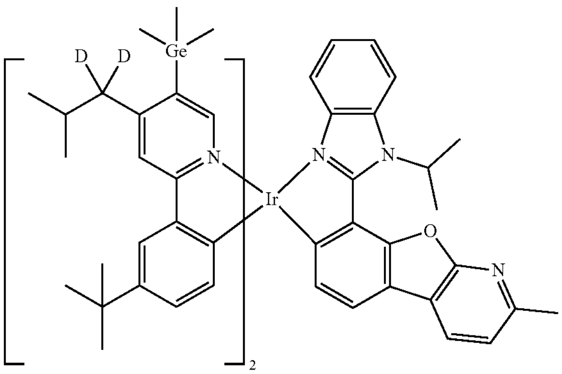

-continued
1363
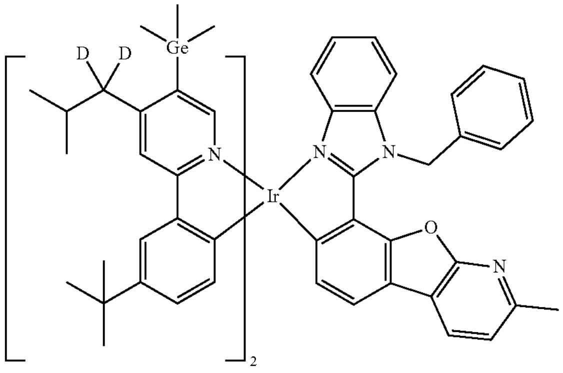
1364
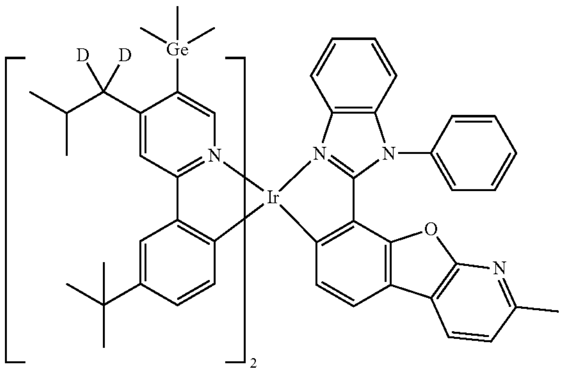
1365
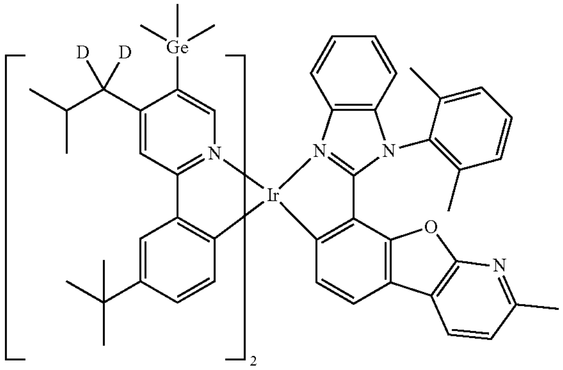
1366
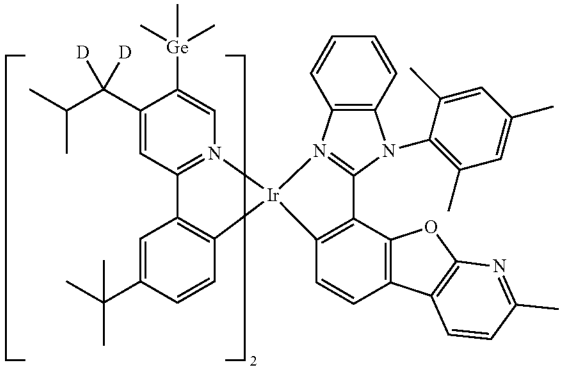
-continued
1367
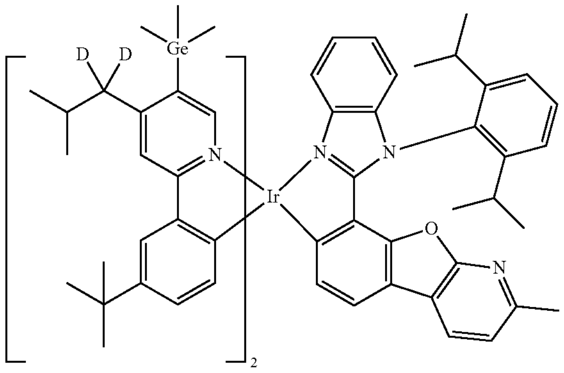
1368
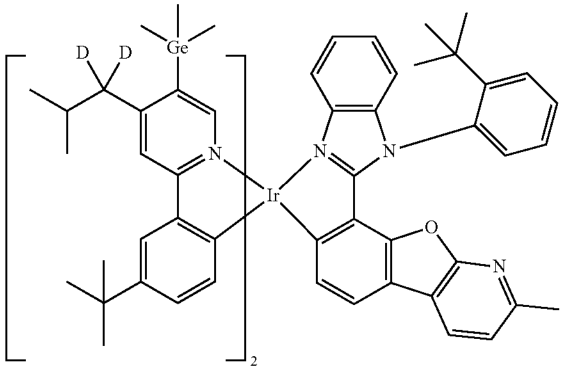
1369
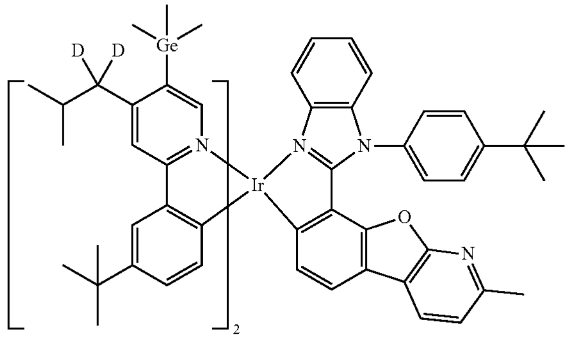
1370
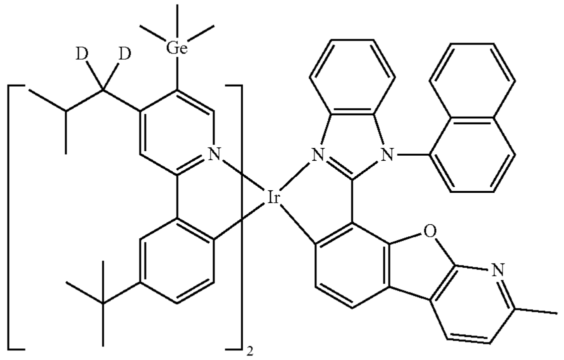

-continued
1371
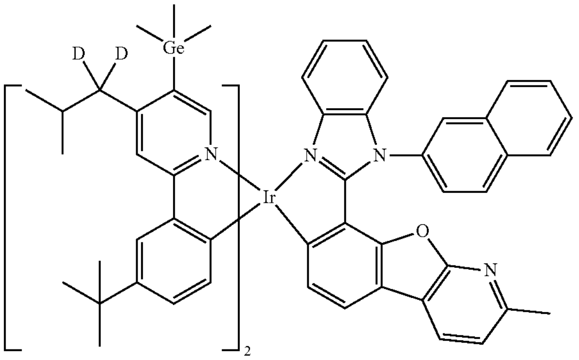
1372
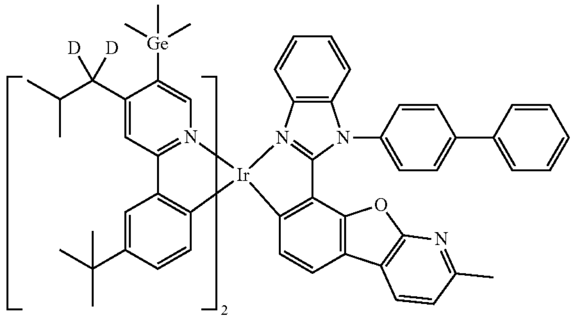
1373
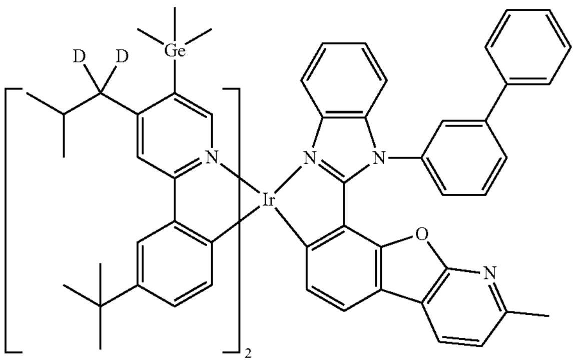
1374
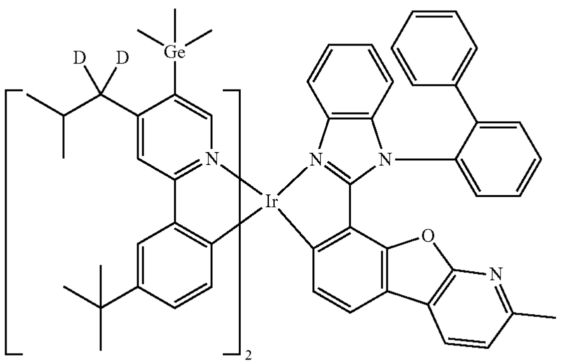
-continued
1375
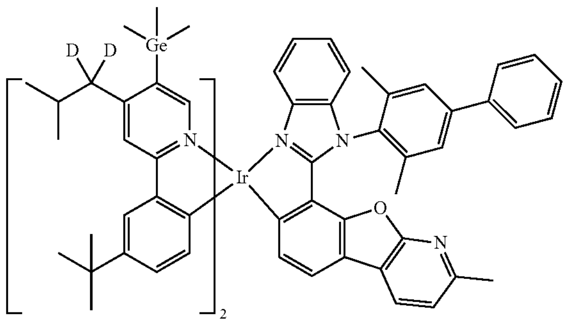
1376
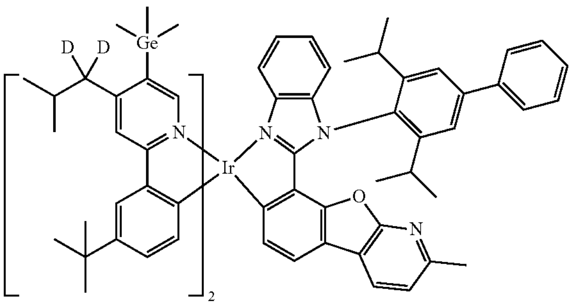
1377
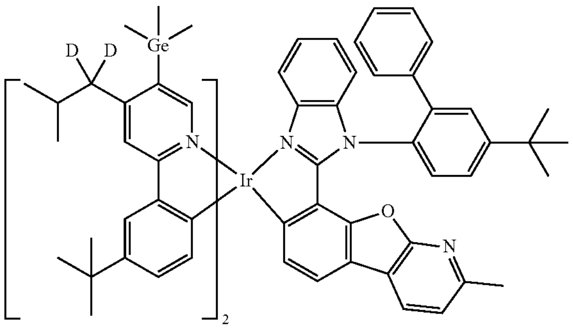
1378
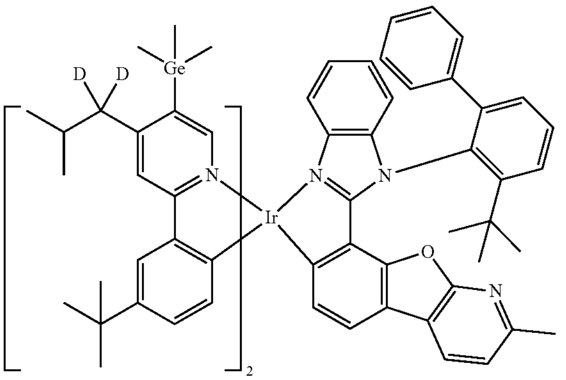

-continued
1379
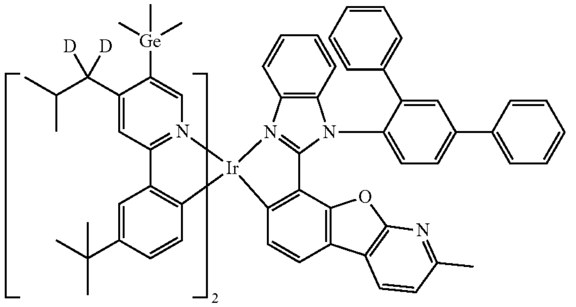
1380
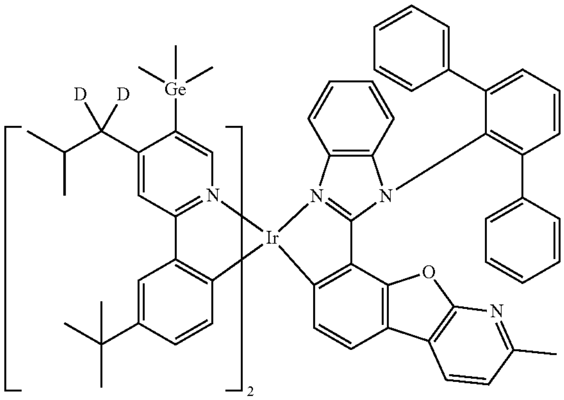
1381
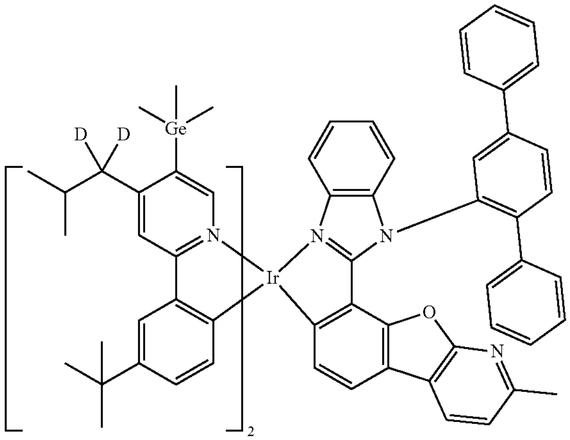
1382
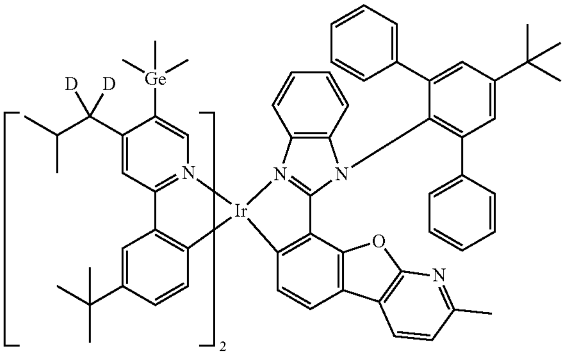
-continued
1383
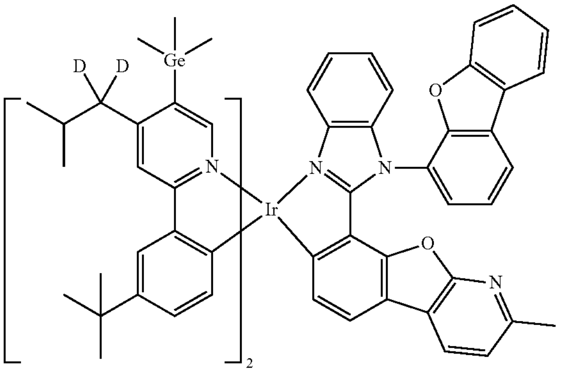
1384
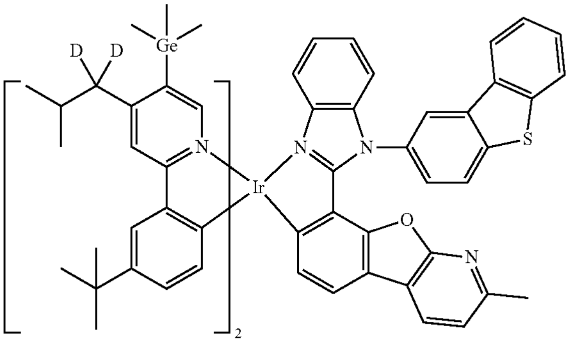
1385
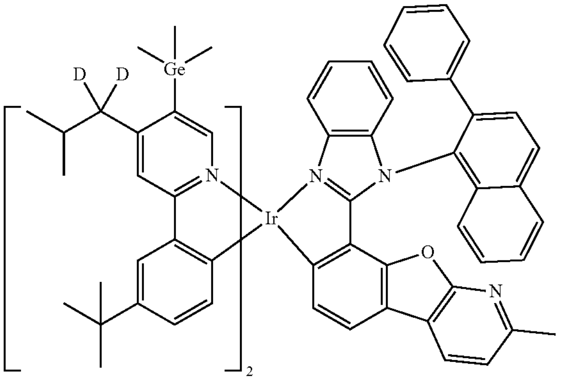
1386
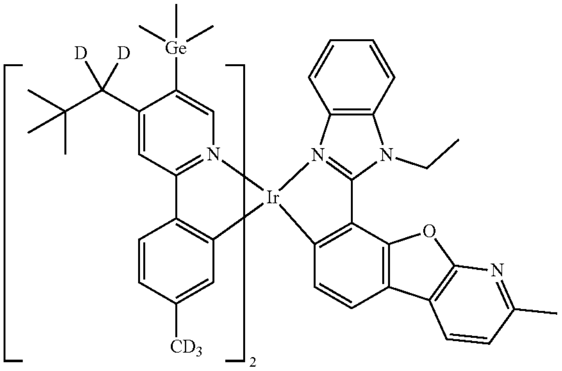

1387
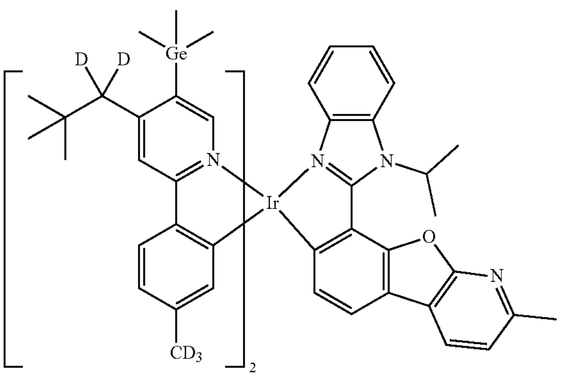
1388
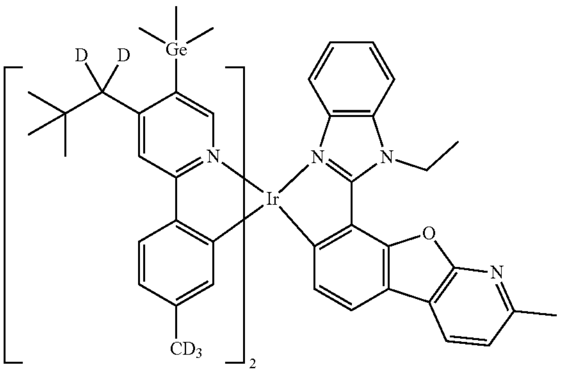
1389
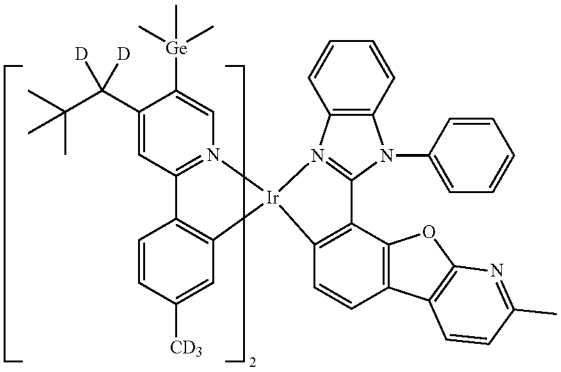
1390
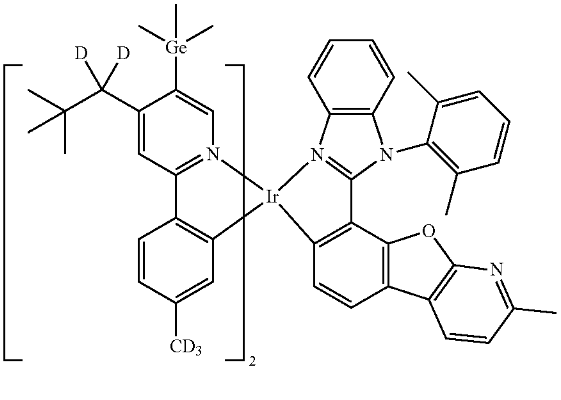
1391
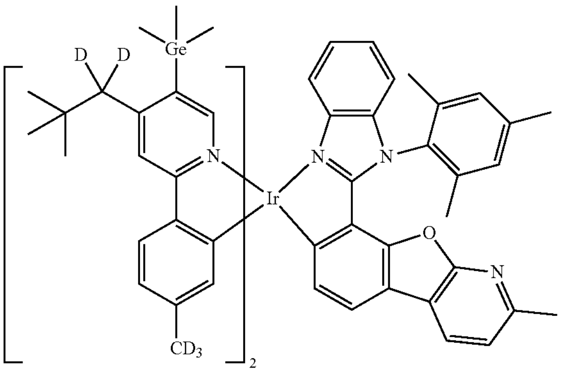
1392
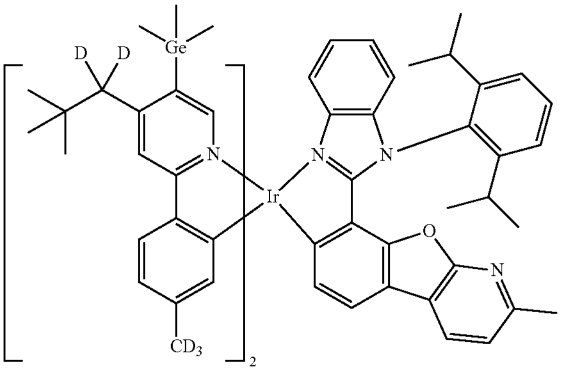
1393
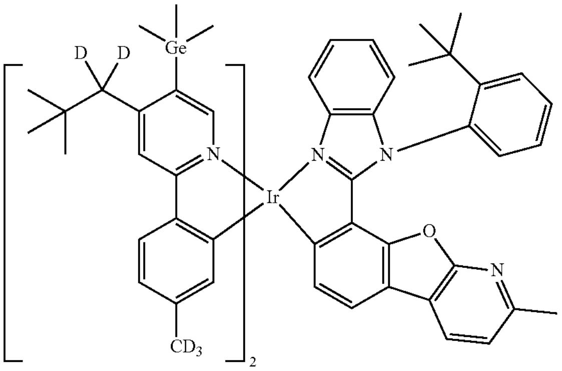
1394
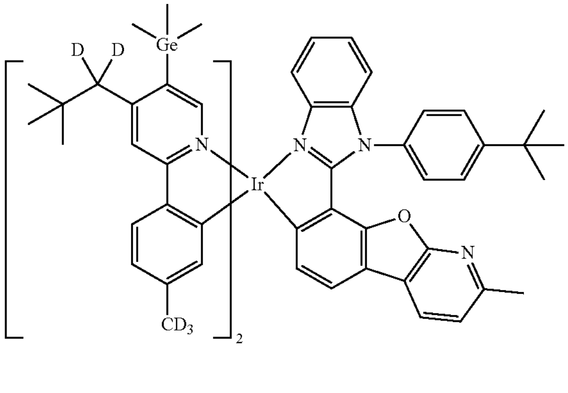

-continued
1395
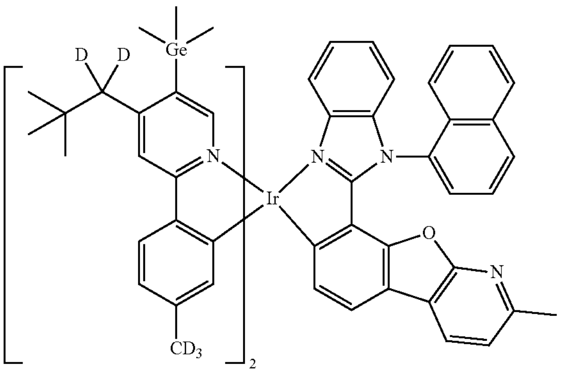
1396
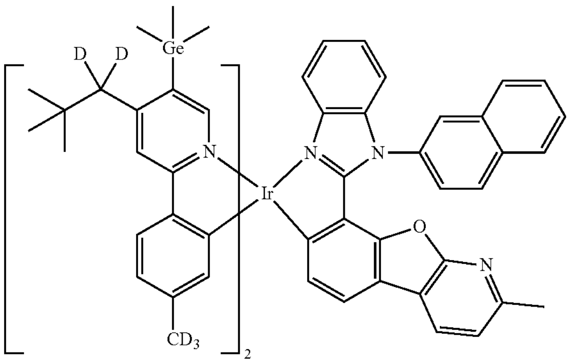
1397
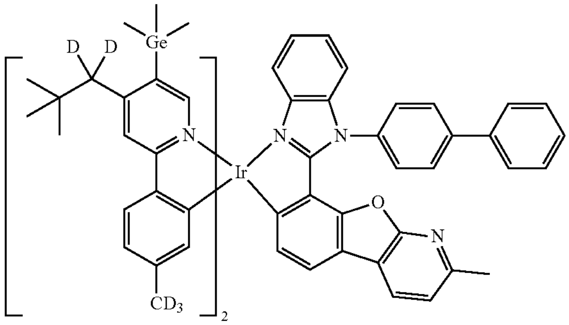
1398
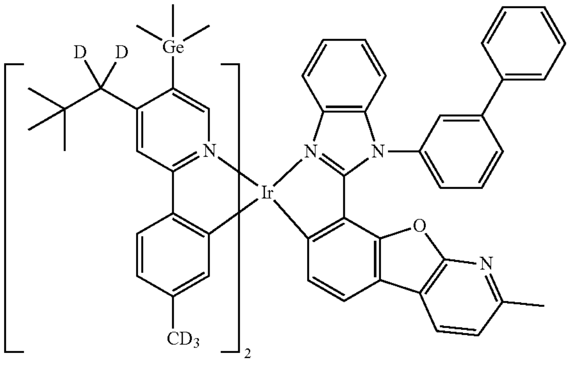
-continued
1399
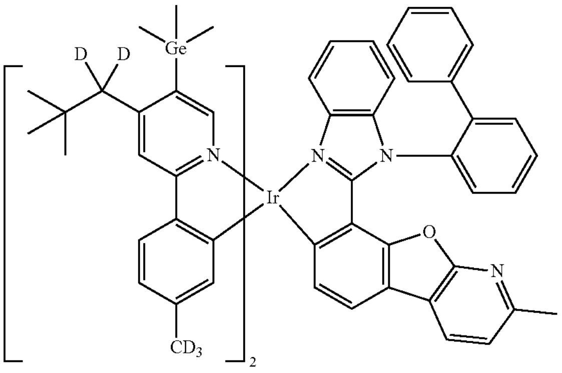
1400
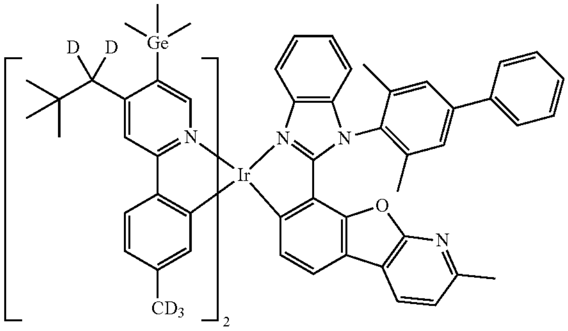
1401
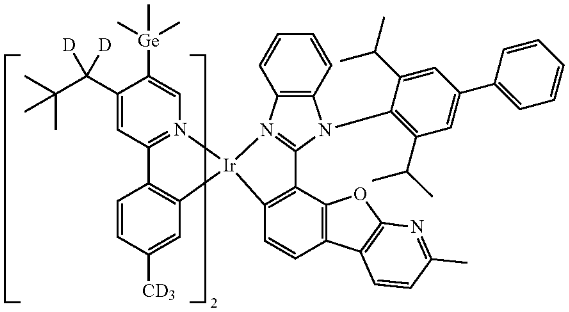
1402
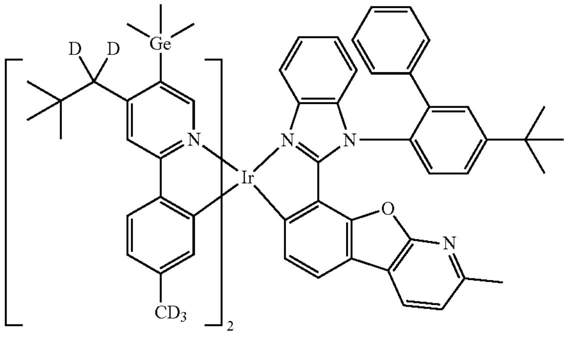

-continued
1403
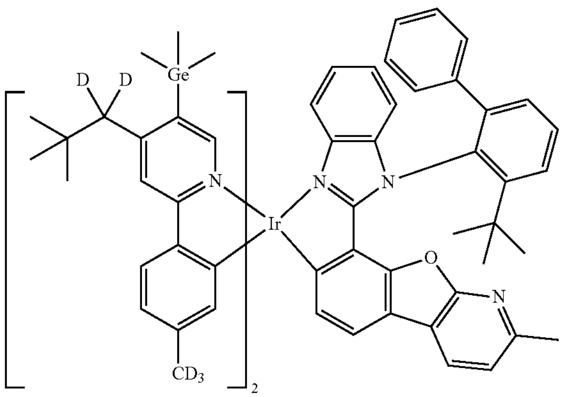
1404
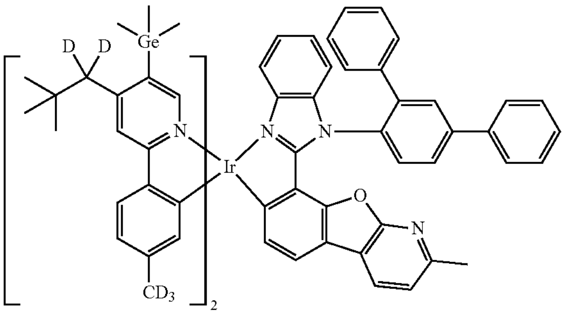
1405
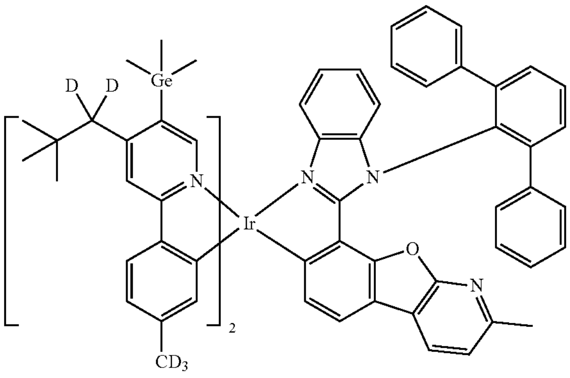
-continued
1406
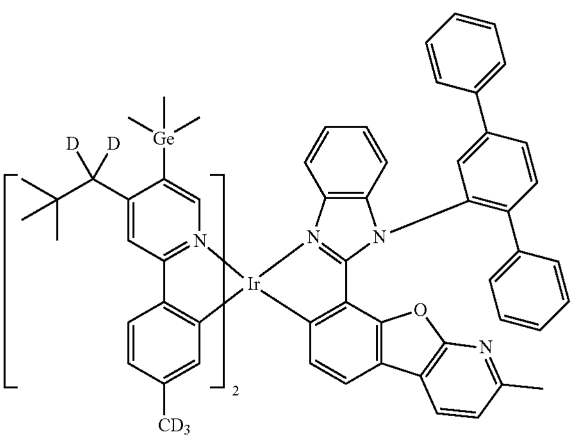
1407
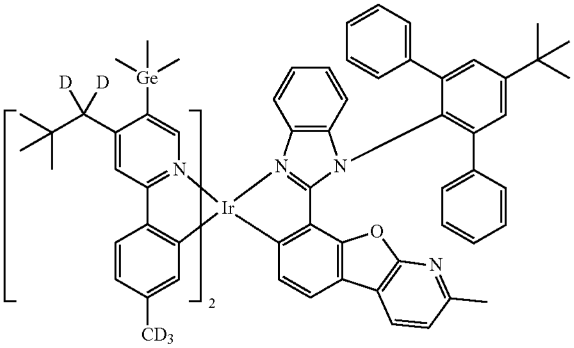
1408
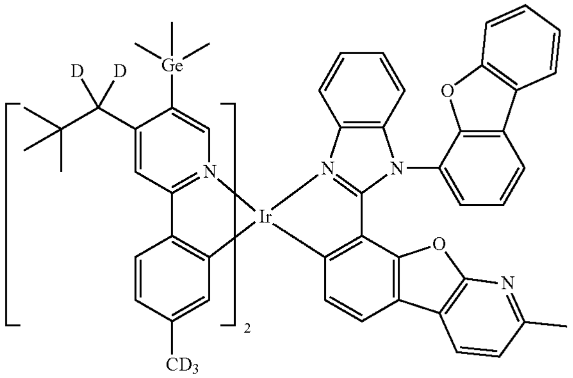
1409
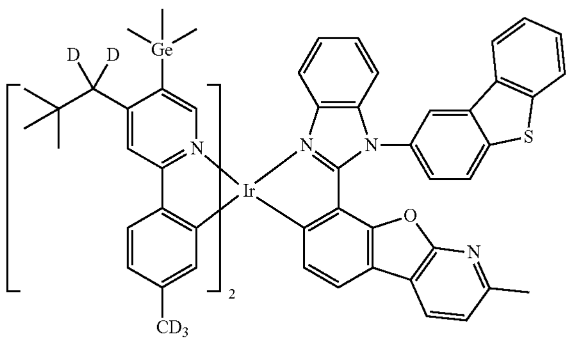

1410
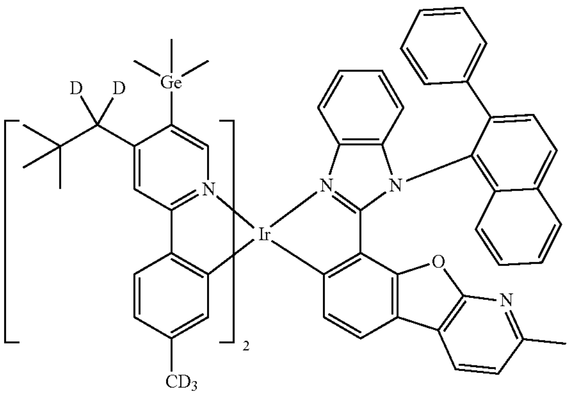
1411
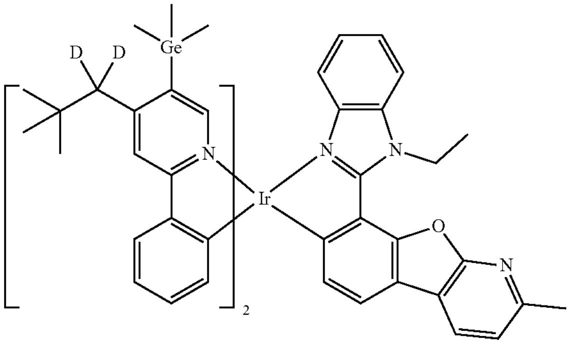
1412
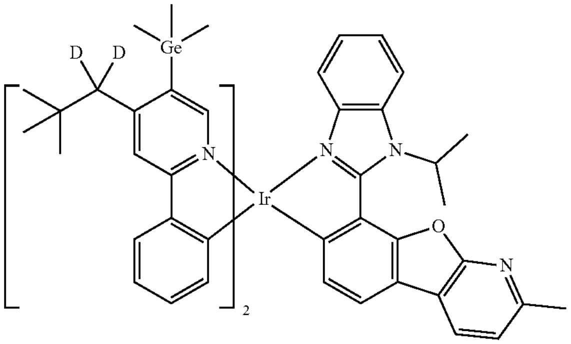
1413
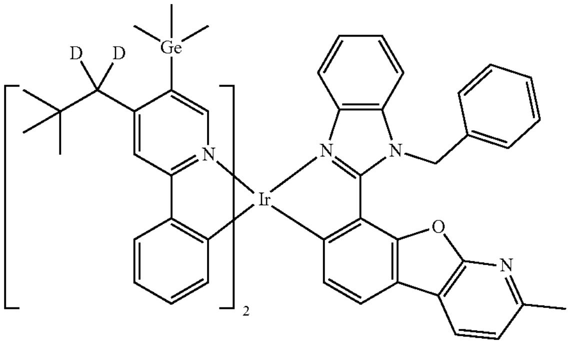
1414
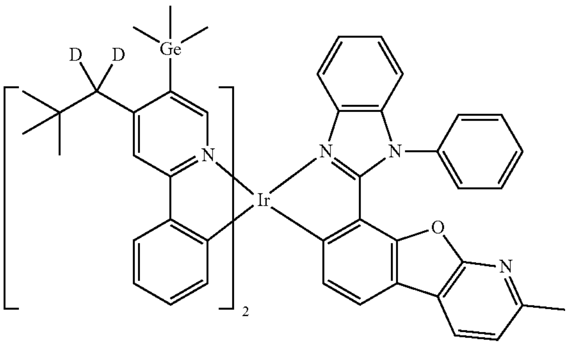
1415
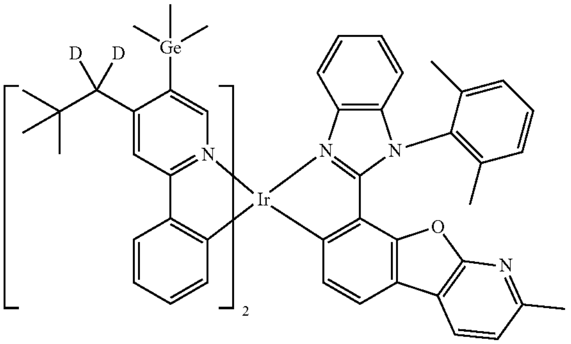
1416
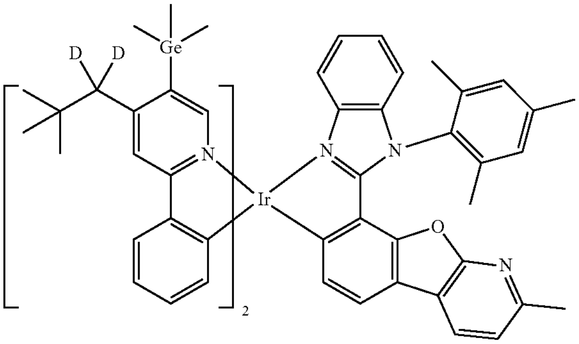
1417
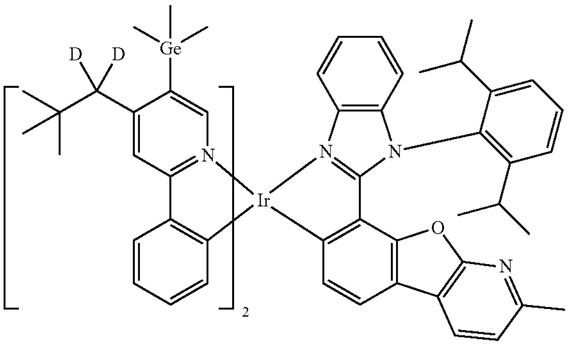

-continued
1418
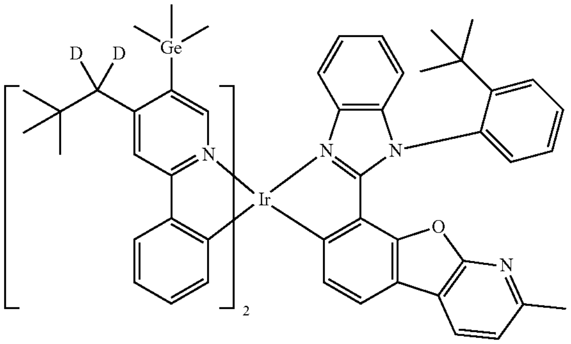
1419
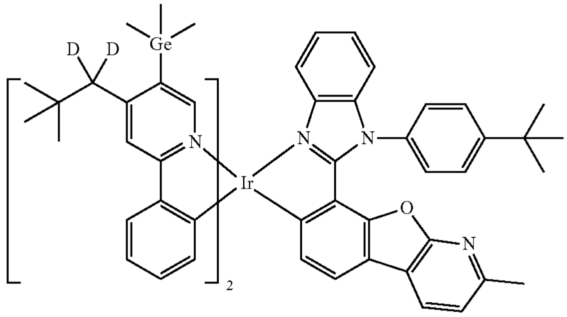
1420
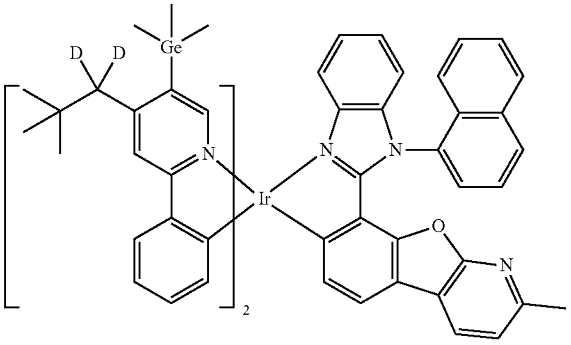
1421
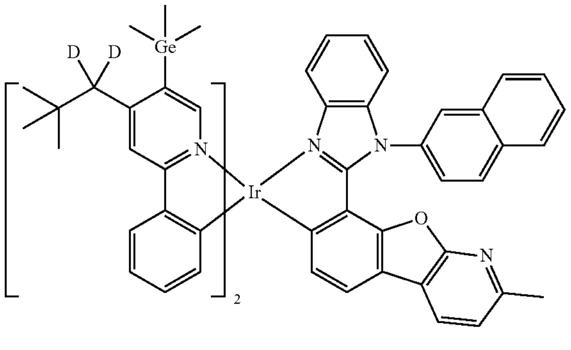
-continued
1422
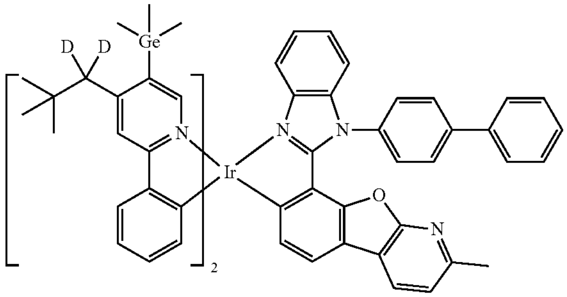
1423
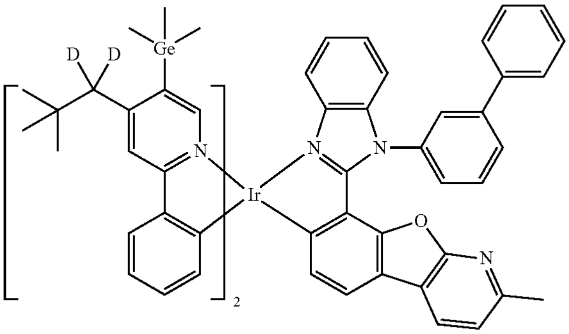
1424
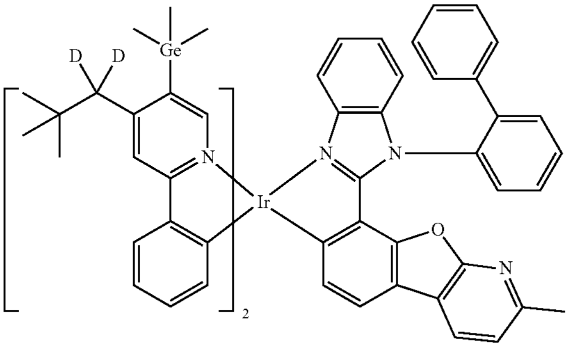
1425
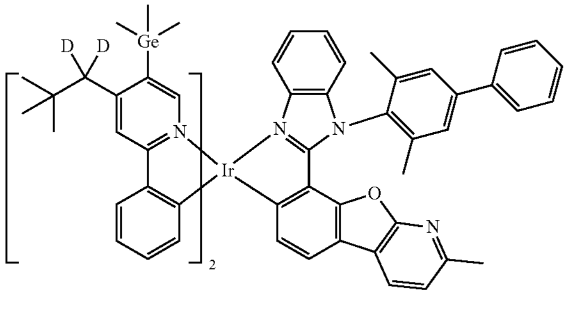

-continued
1426
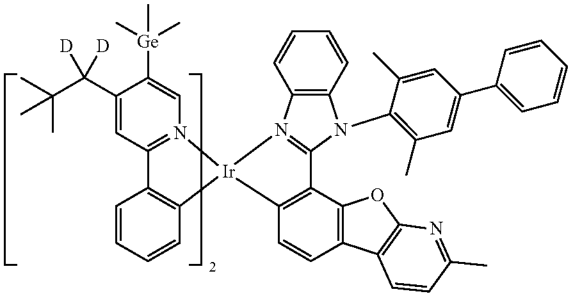
1427
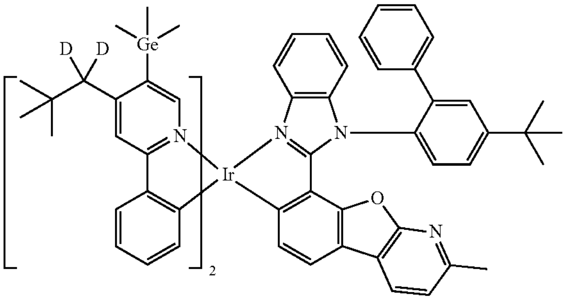
1428
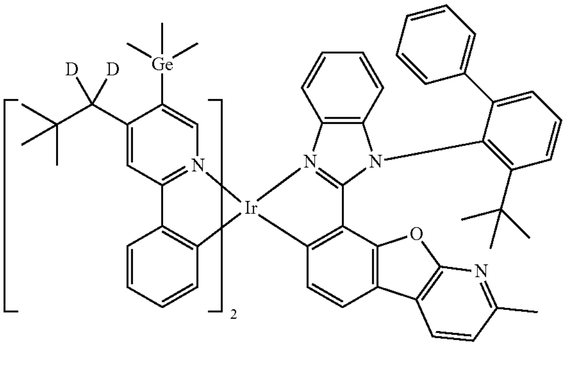
1429
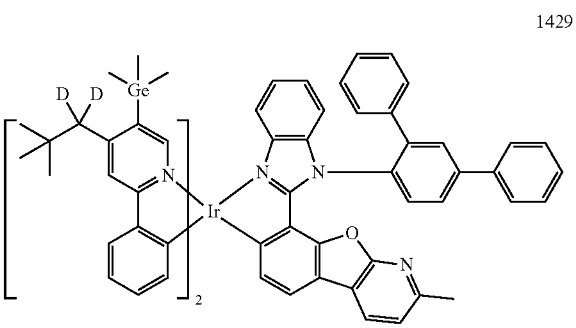
-continued
1430
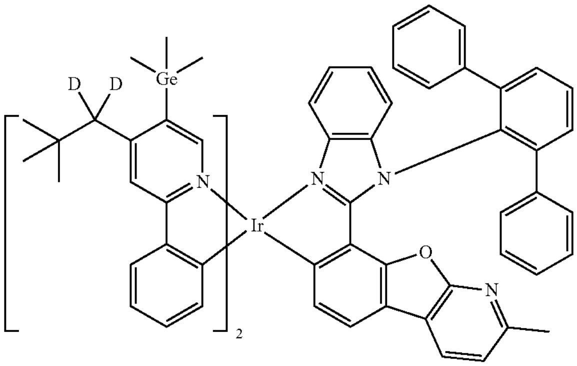
1431
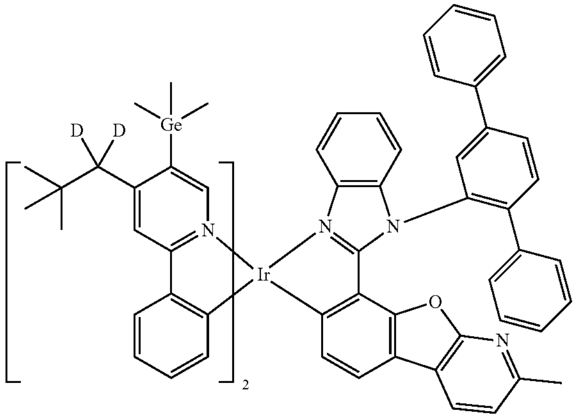
1432
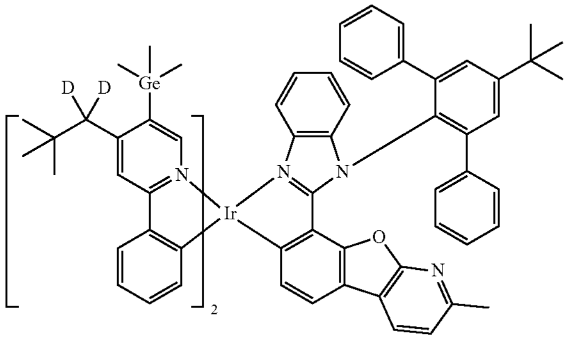
1433
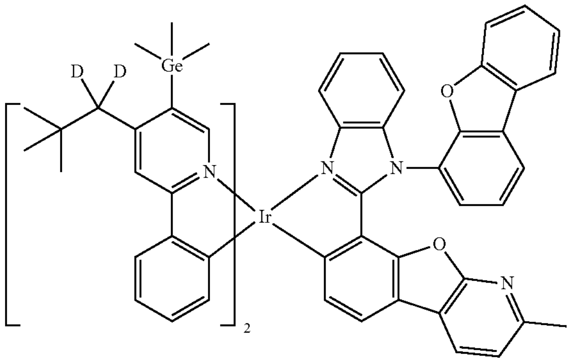

-continued
1434
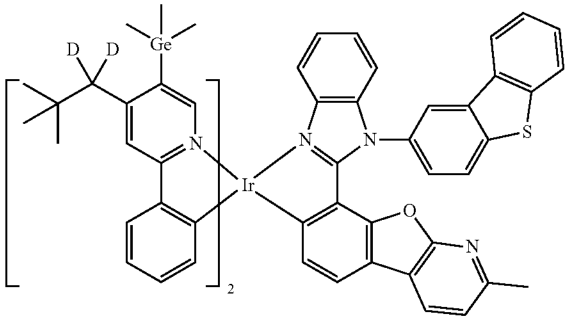
1435
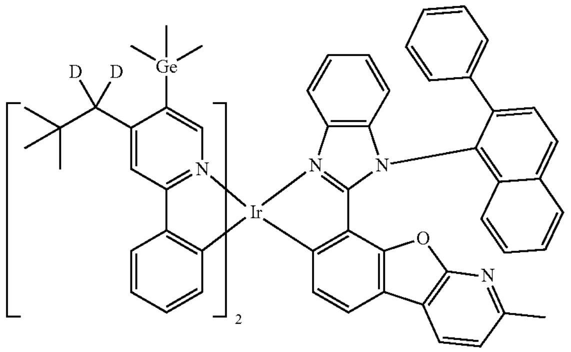
1436
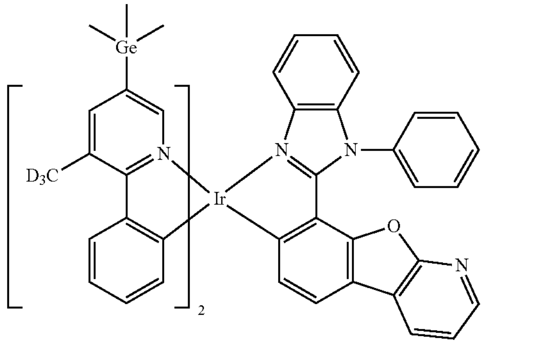
1437
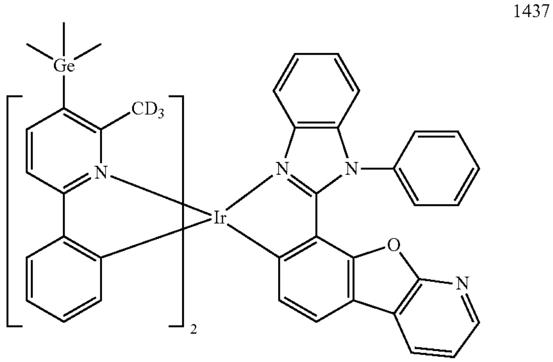
-continued
1438
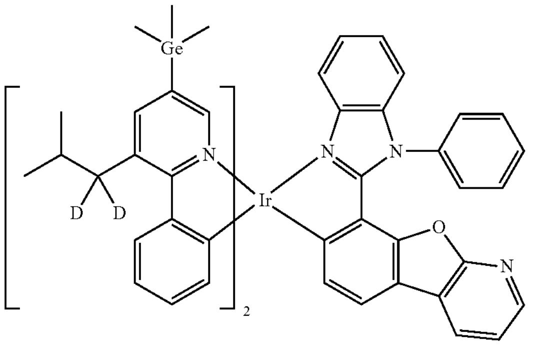
1439
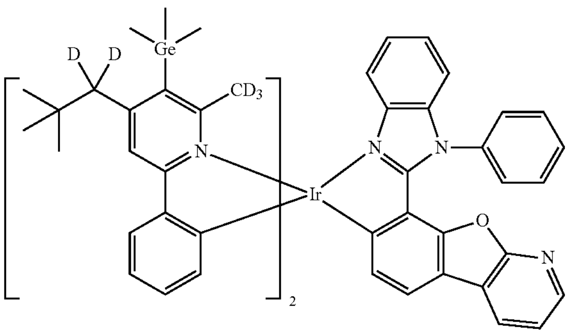
1440
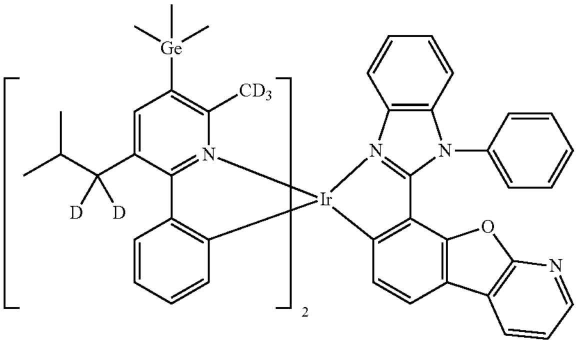
1441
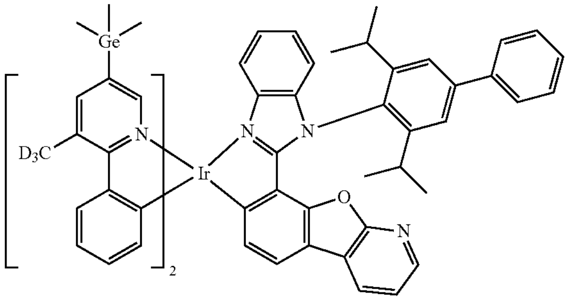

-continued
1442
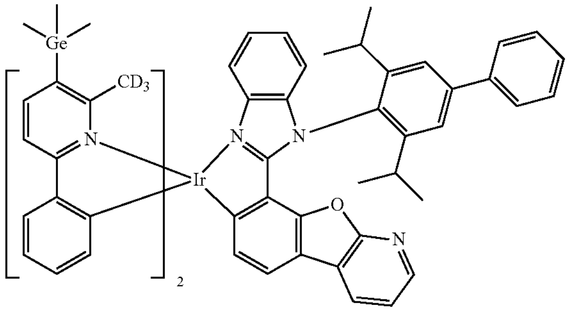
1443
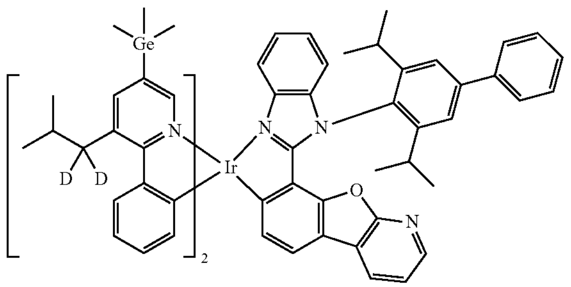
1444
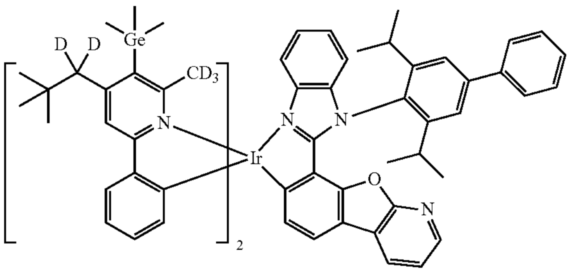
1445
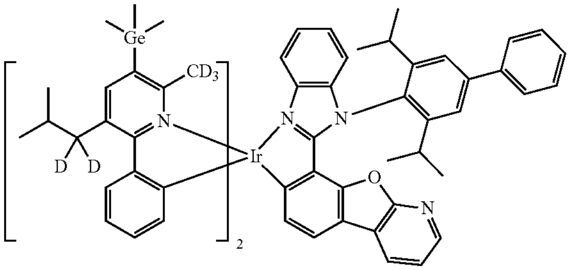
1446
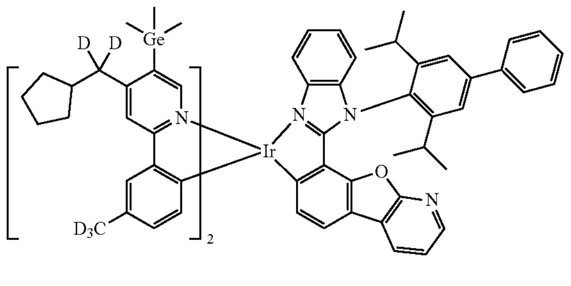
-continued
1447
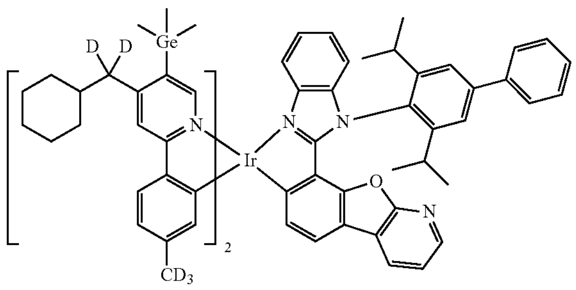
1448
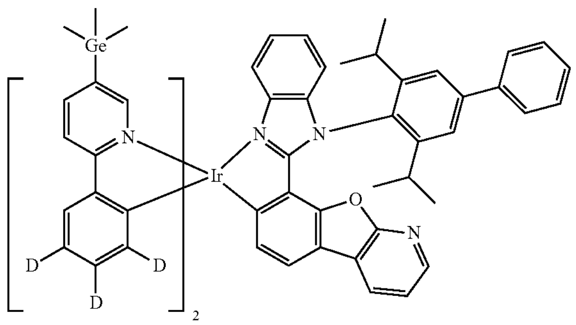
1449
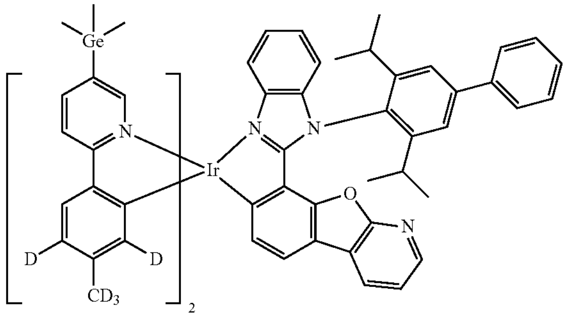
1450
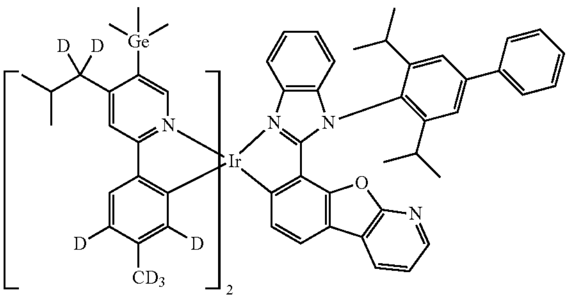
1451
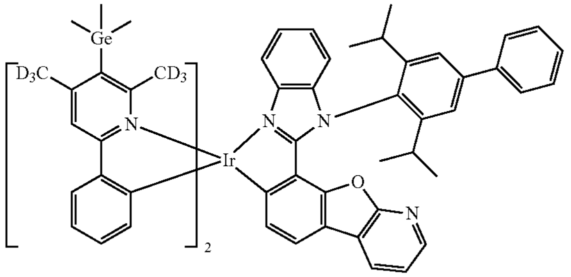

-continued
1452
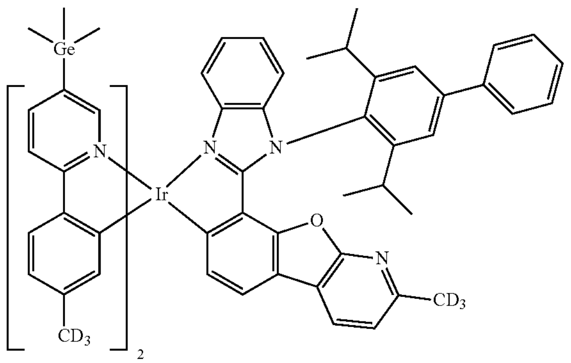
1453
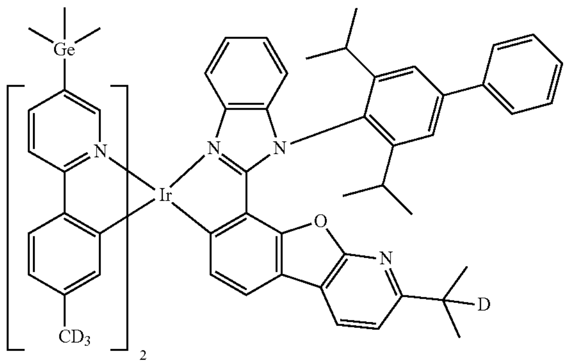
1454
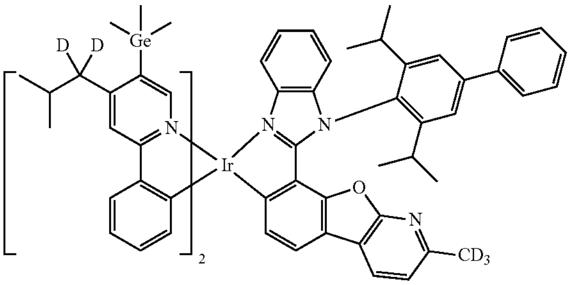
1455
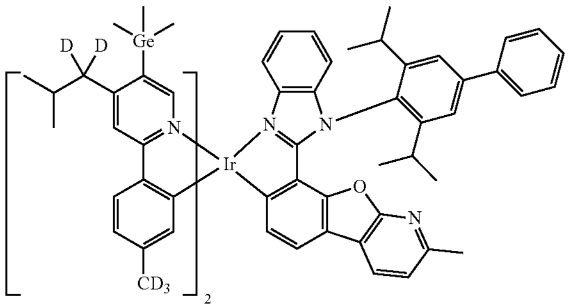
-continued
1456
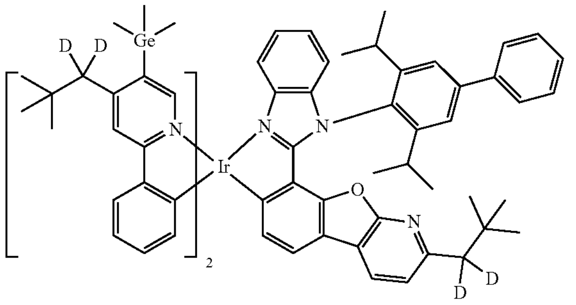
1457
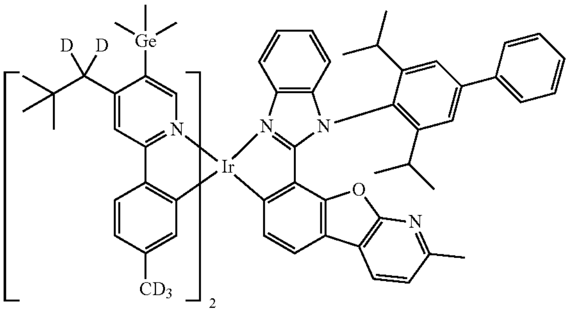
1458
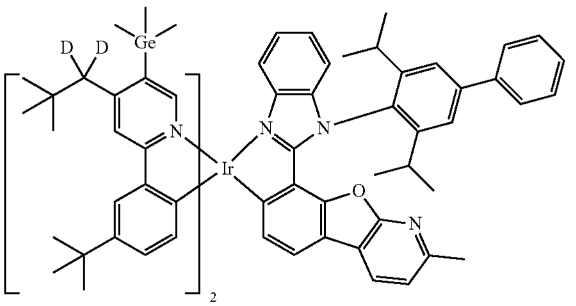
1459
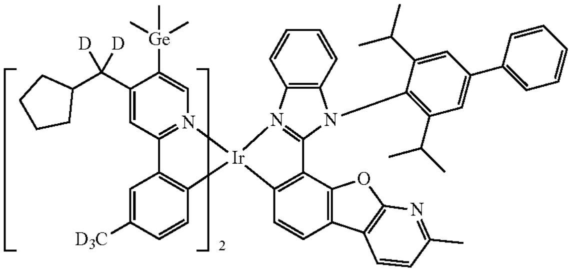
1460
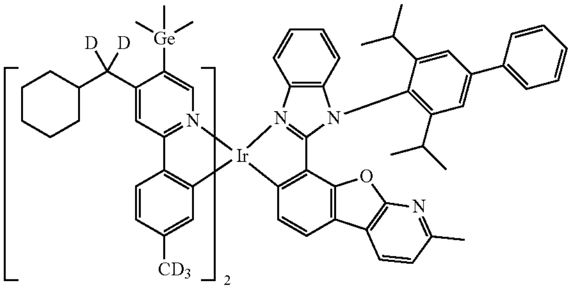

-continued
1461
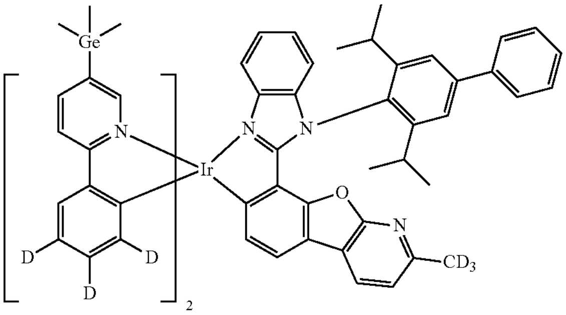
1462
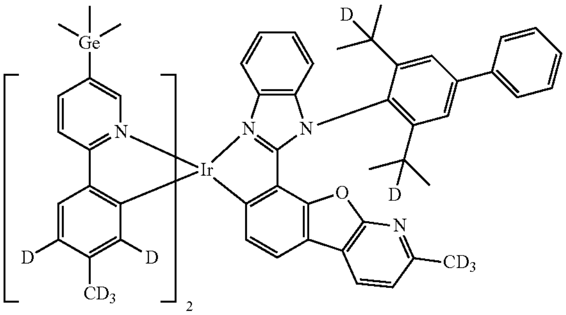
1463
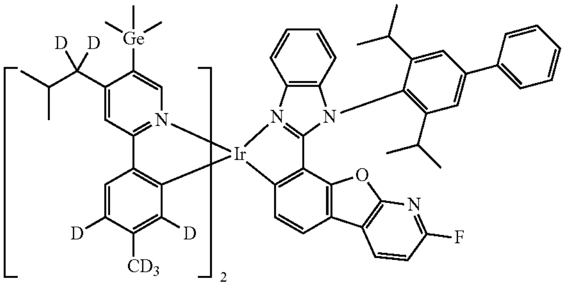
1464
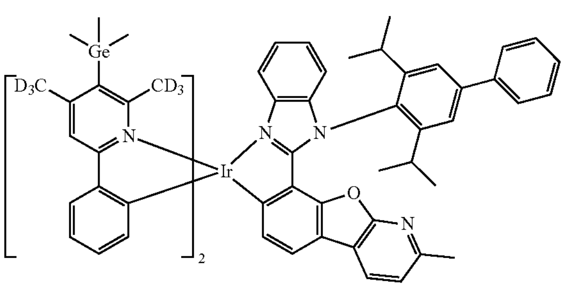
-continued
1465
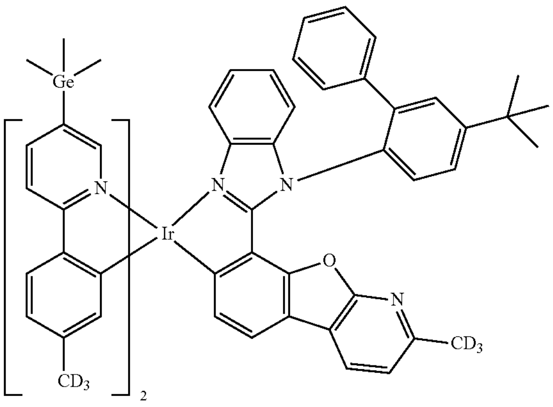
1466
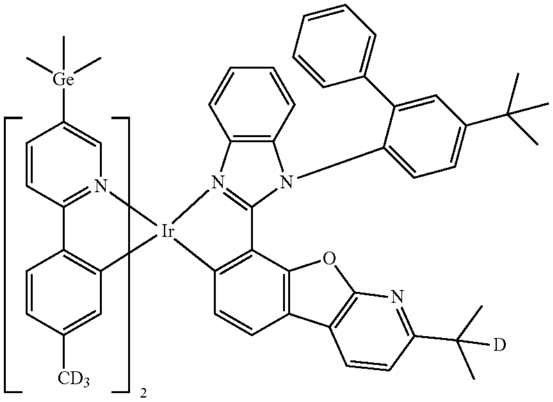
1467
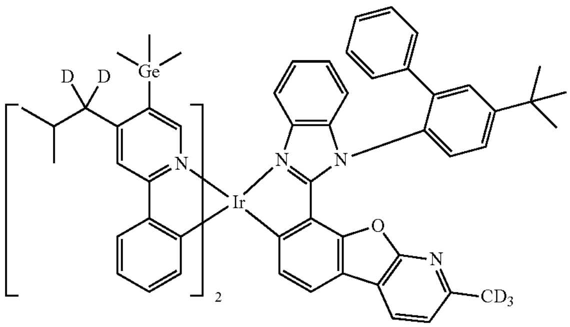
1468
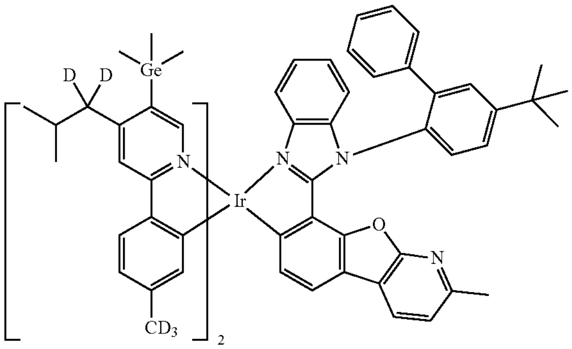

-continued
1469
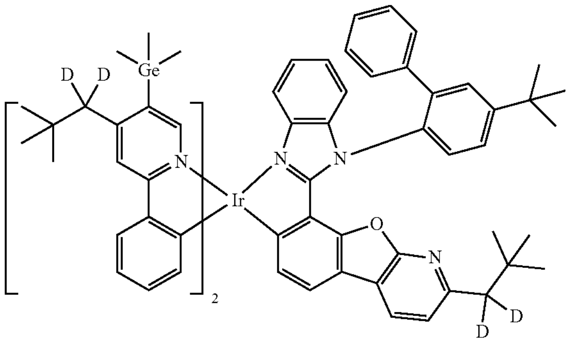
1470
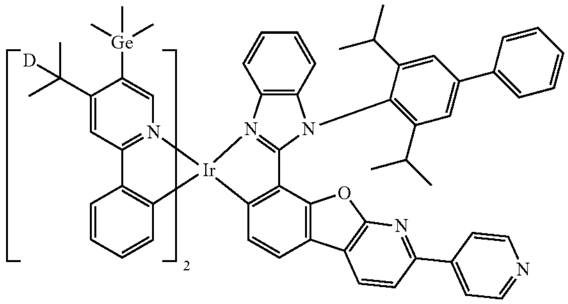
1471
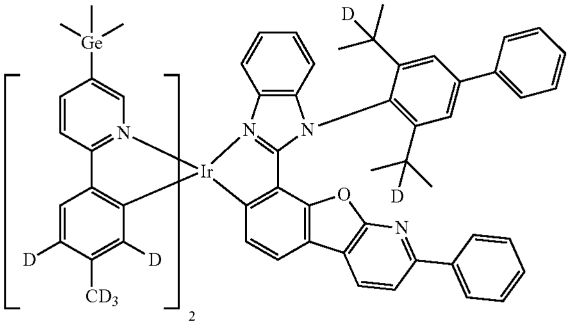
1472
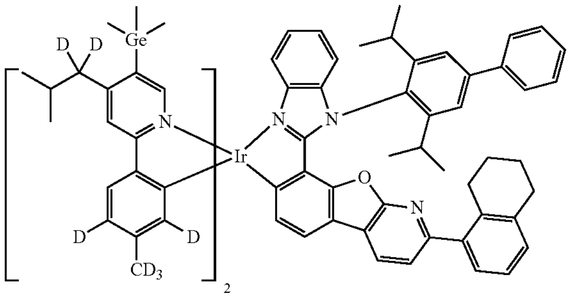
-continued
1473
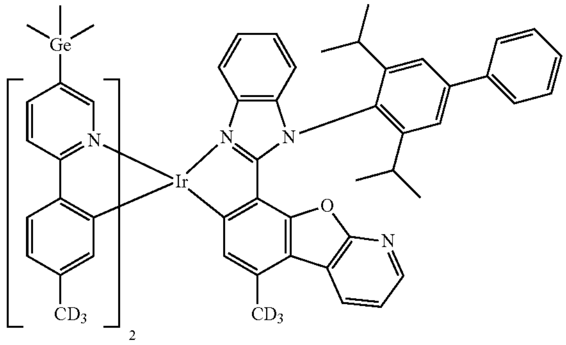
1474
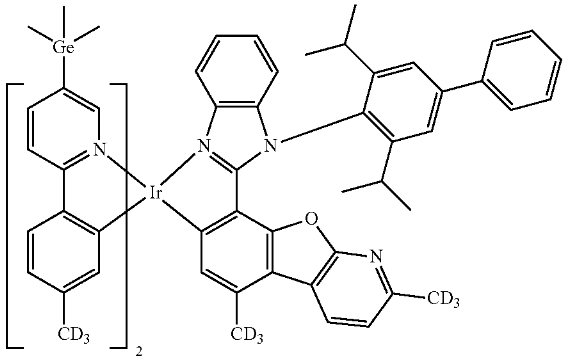
1475
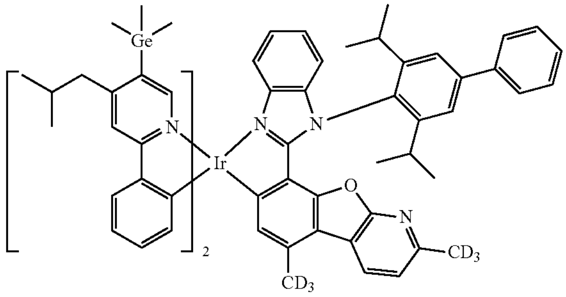
1476
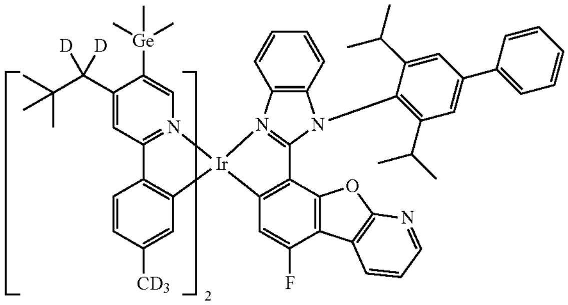

-continued
1477
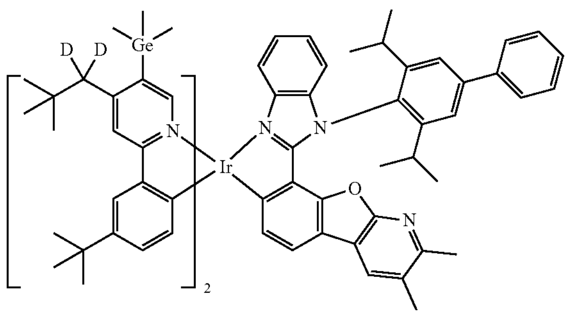
1478
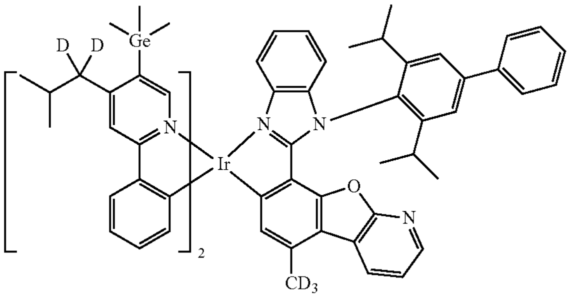
1479
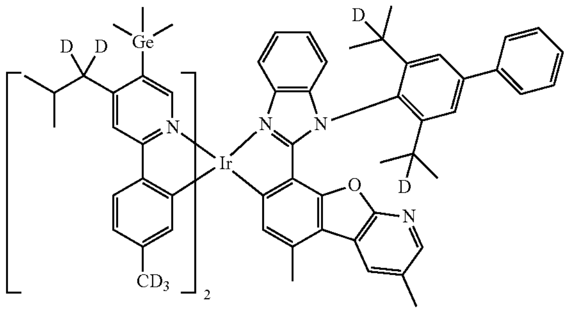
1480
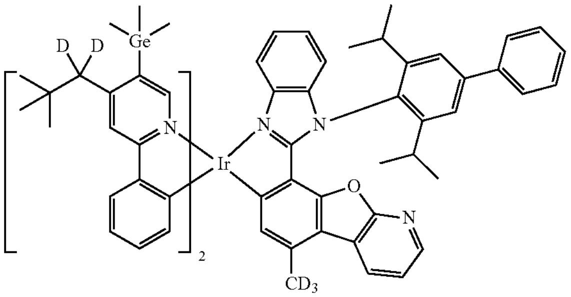
-continued
1481
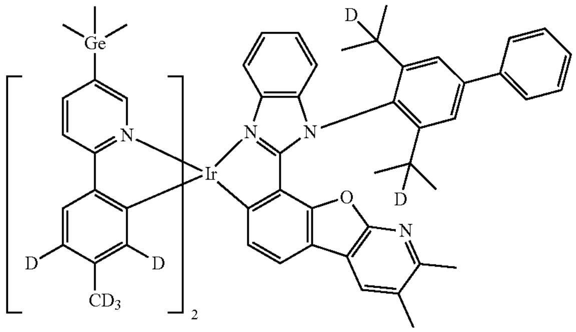
1482
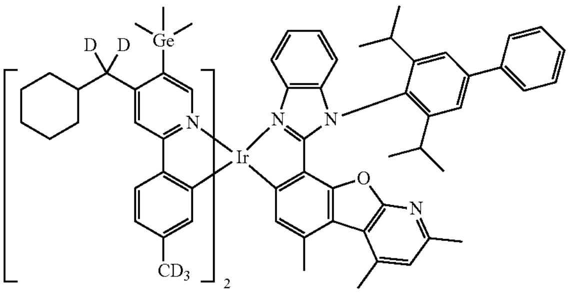
1483
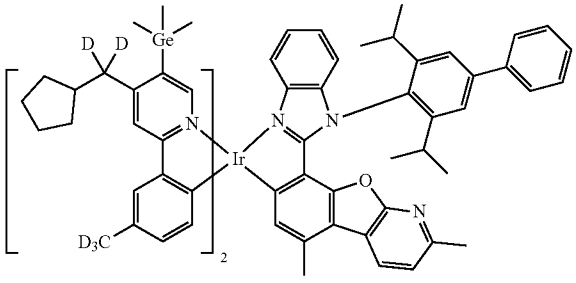
1484
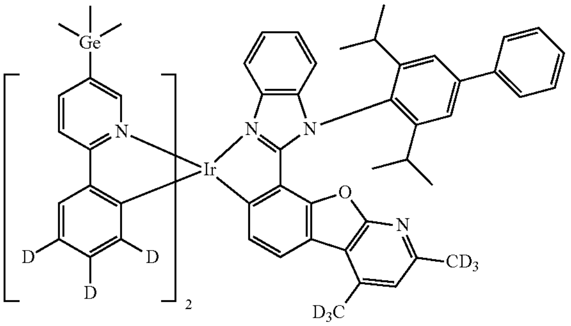
1485
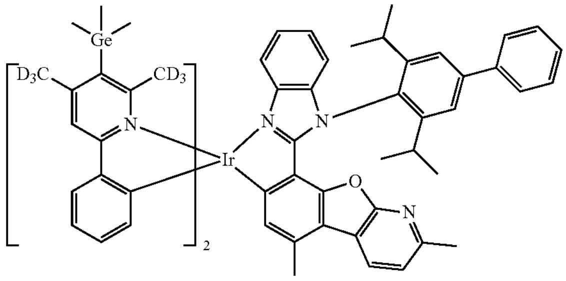

-continued
1486
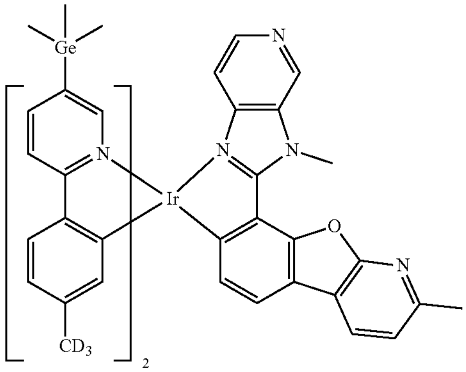
1487
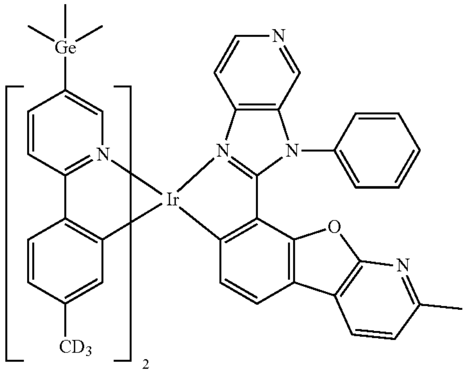
1488
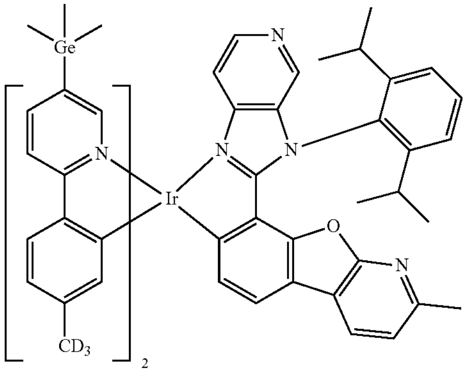
1489
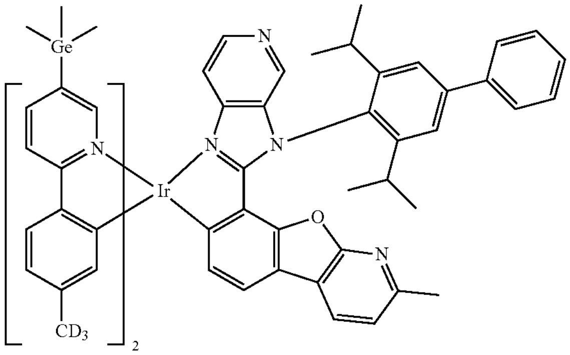
-continued
1490
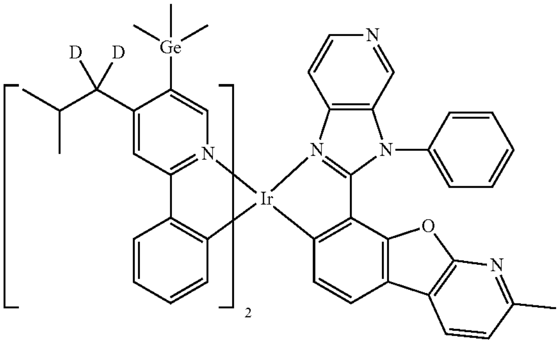
1491
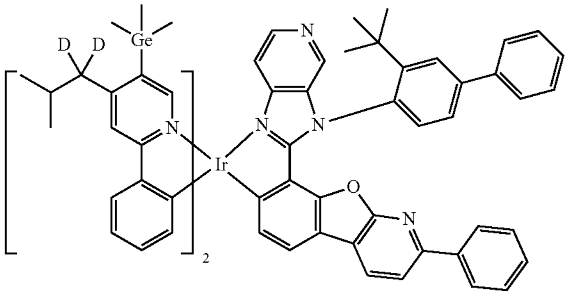
1492
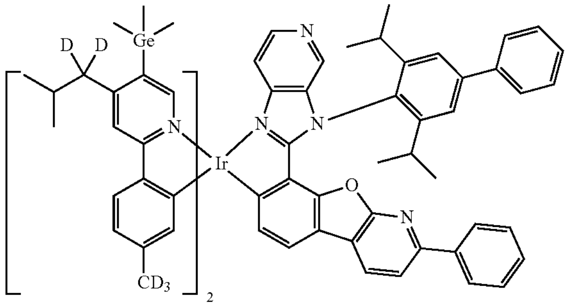
1493
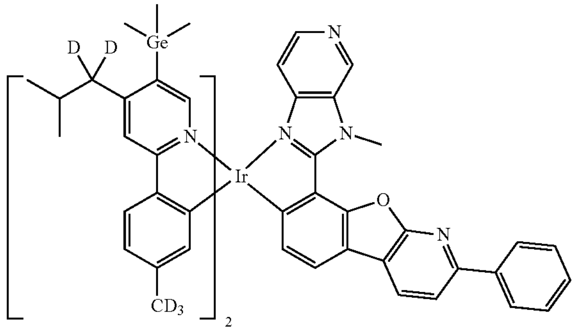

-continued
1494
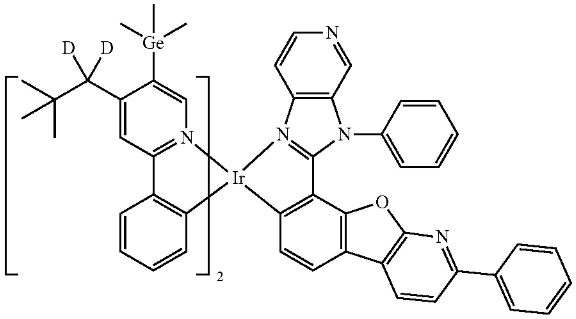
1495
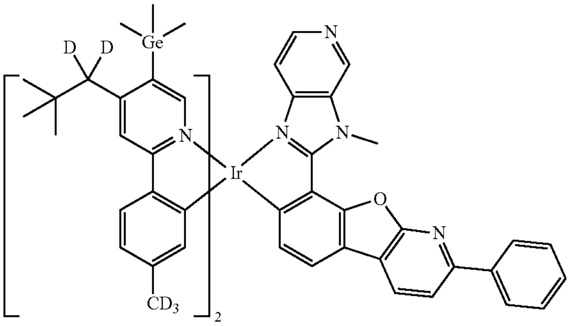
1496
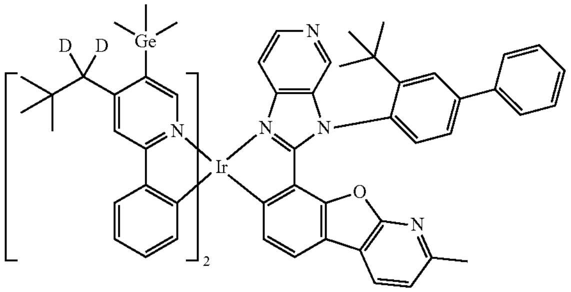
1497
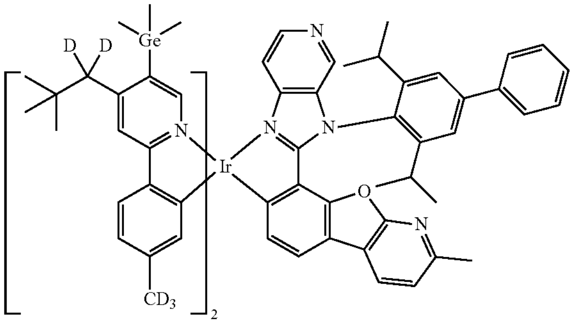
-continued
1498
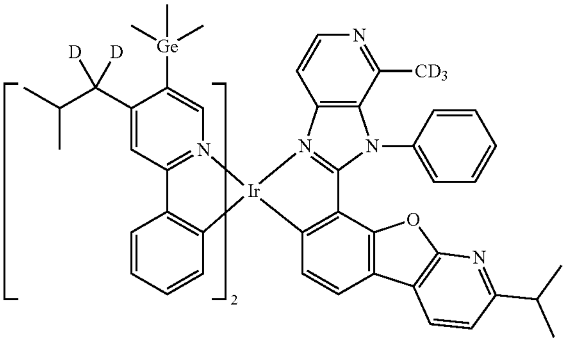
1499
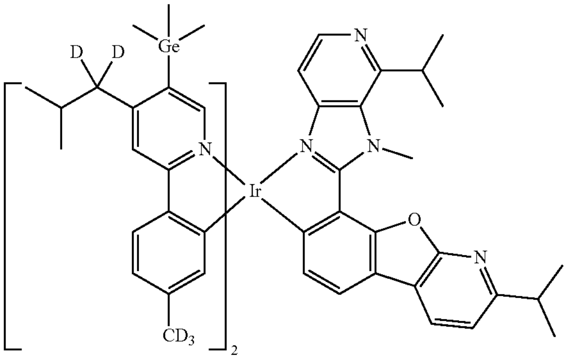
1500
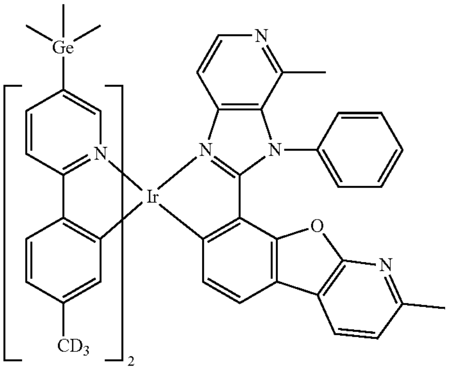
1501
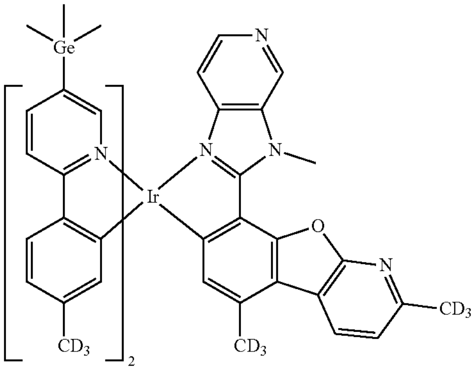

-continued
1502
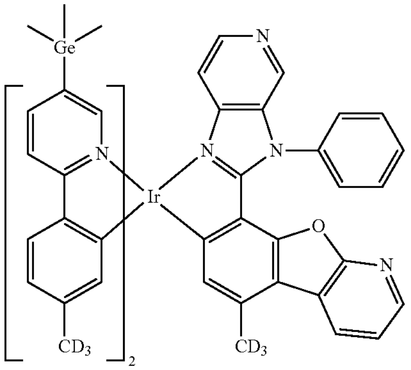
1503
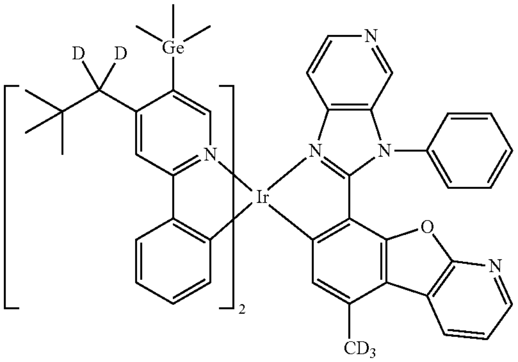
1504
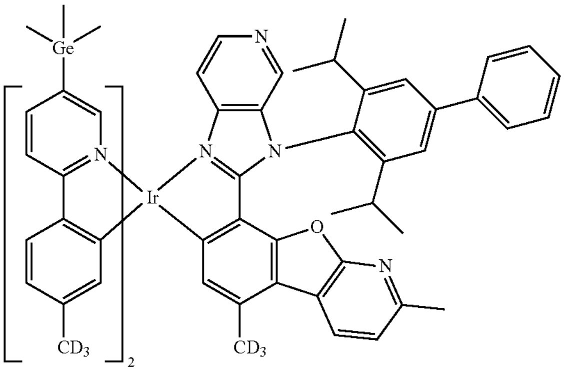
1505
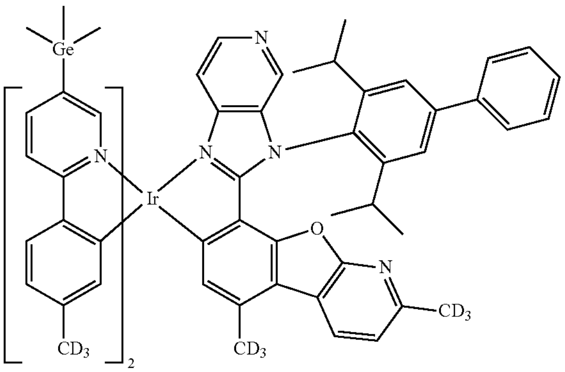
-continued
1506
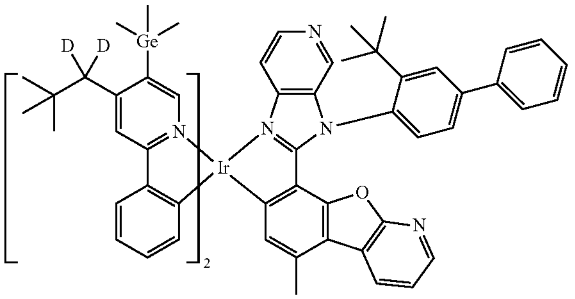
1507
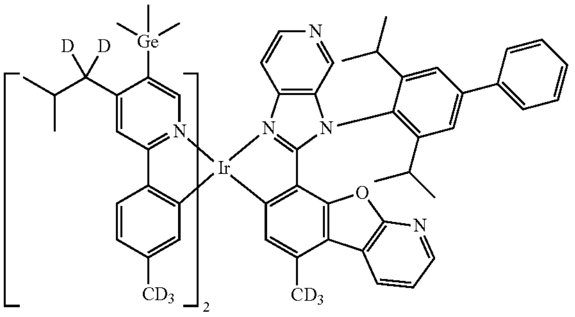
1508
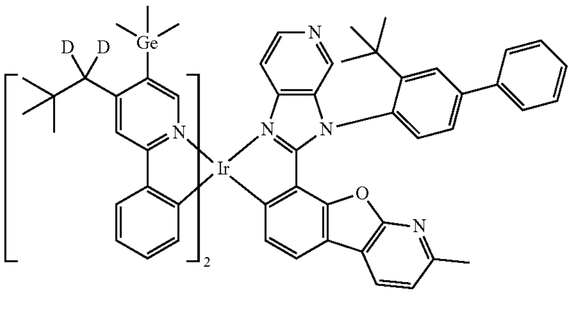
1509
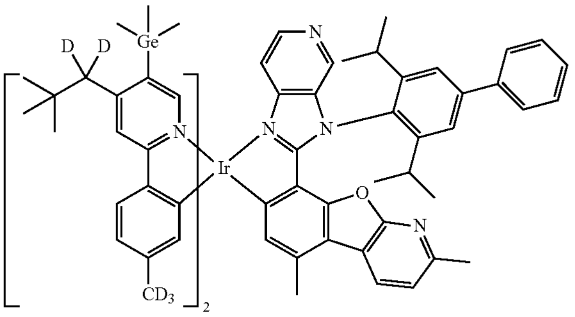

-continued
1510
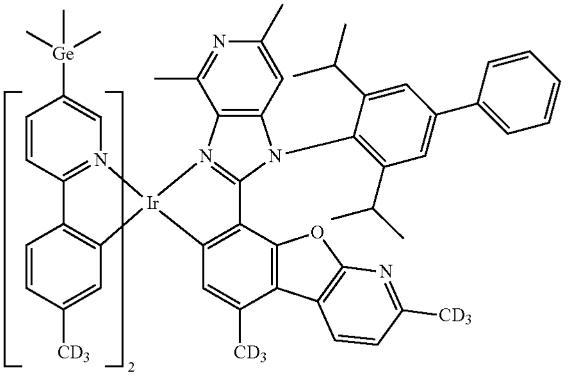
1511
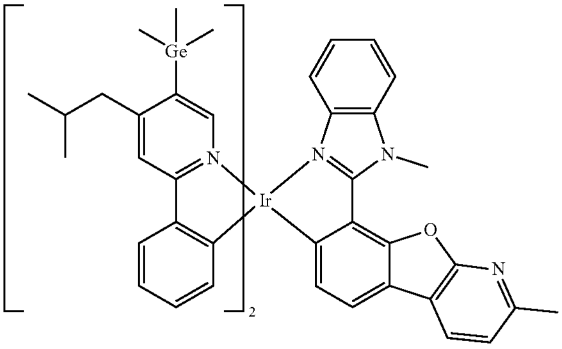
1512
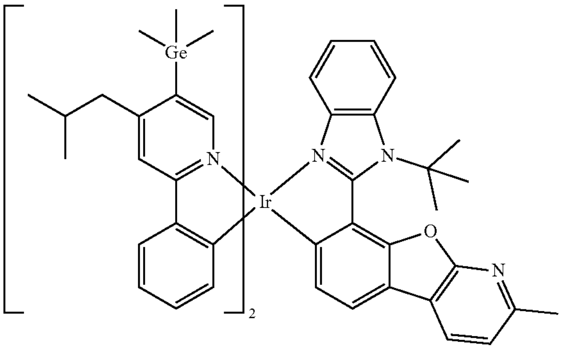
1513
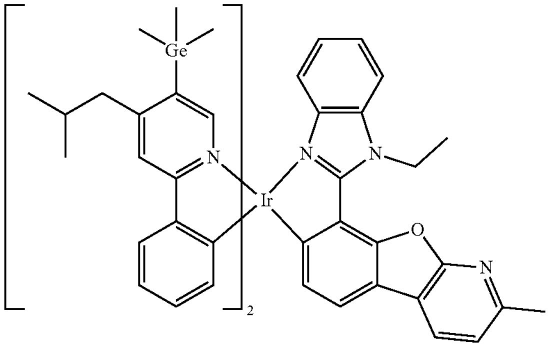
-continued
1514
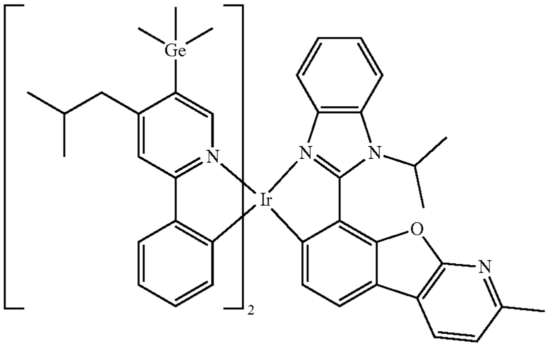
1515
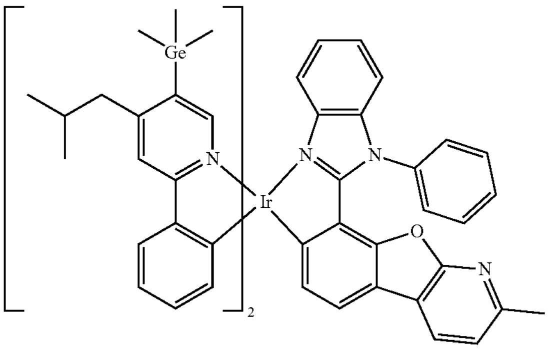
1516
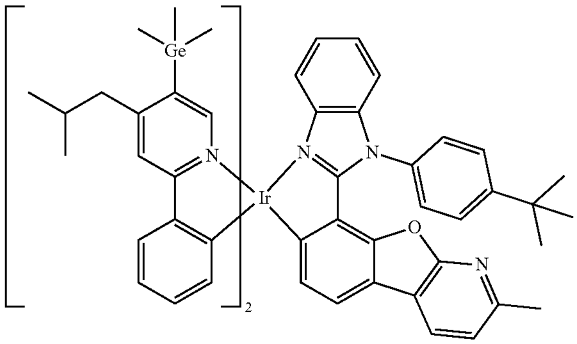
1517
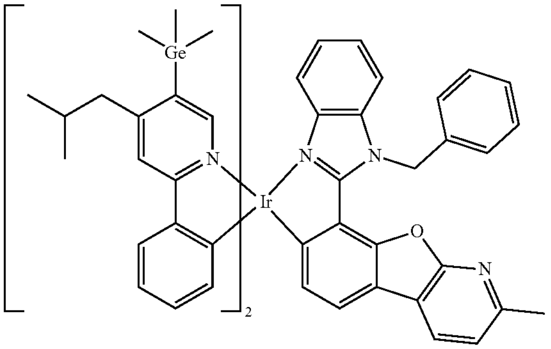

-continued
1518
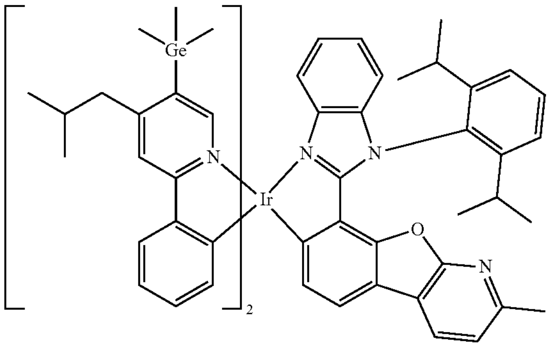
1519
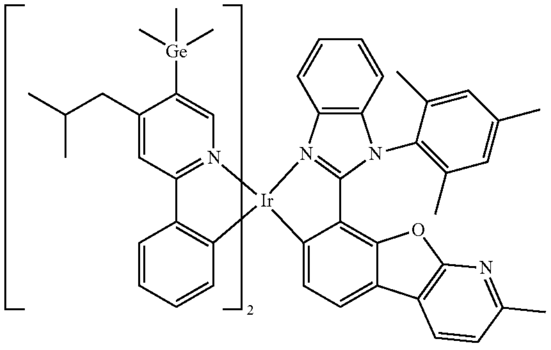
1520
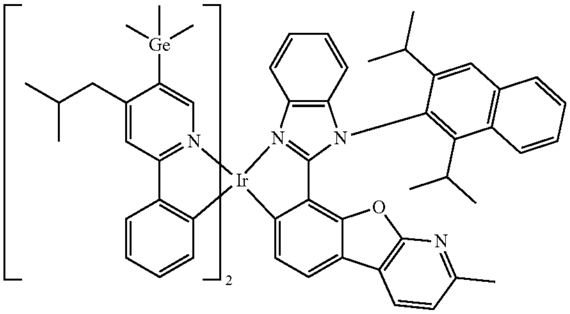
1521
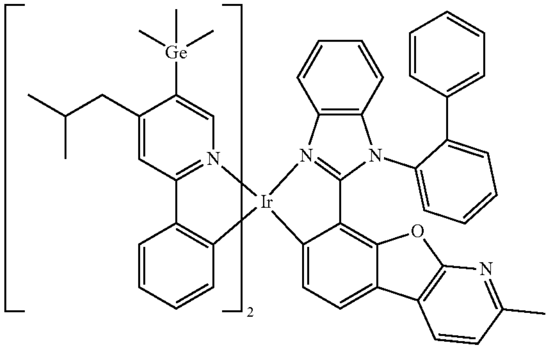
-continued
1522
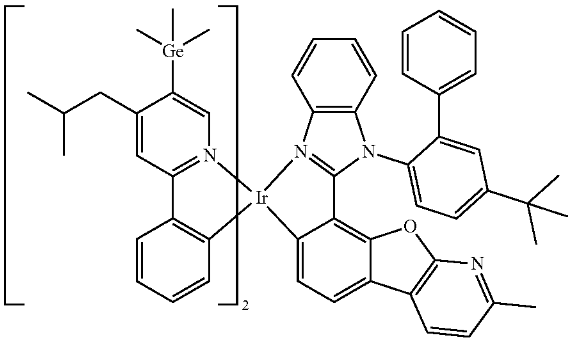
1523
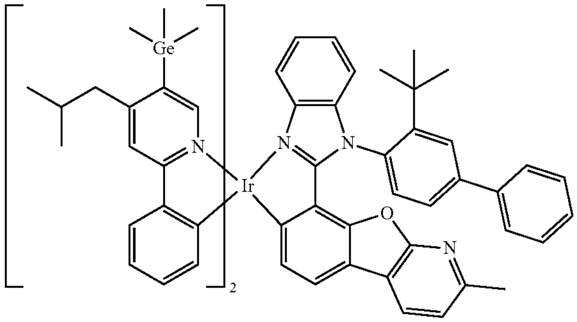
1524
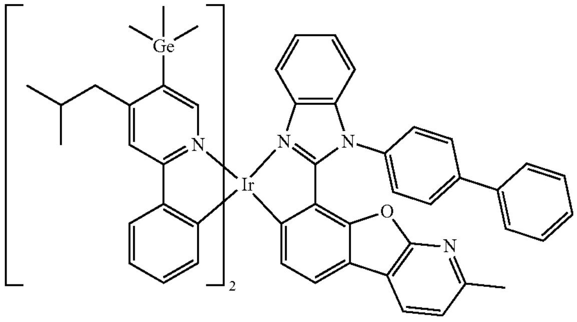
1525
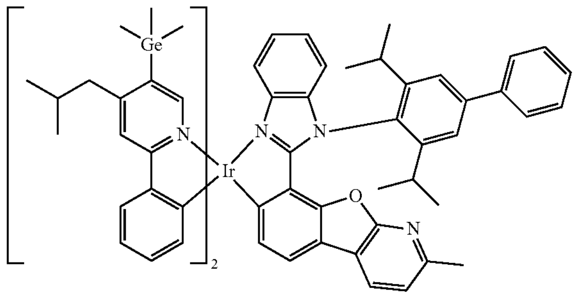

-continued
1526
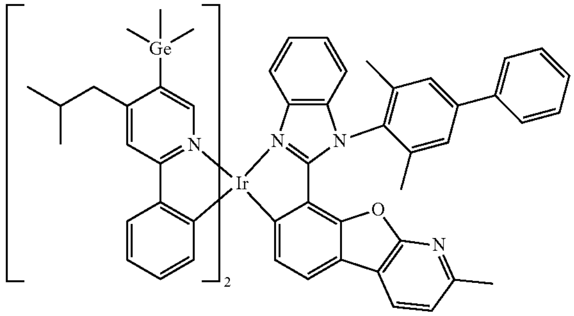
1527
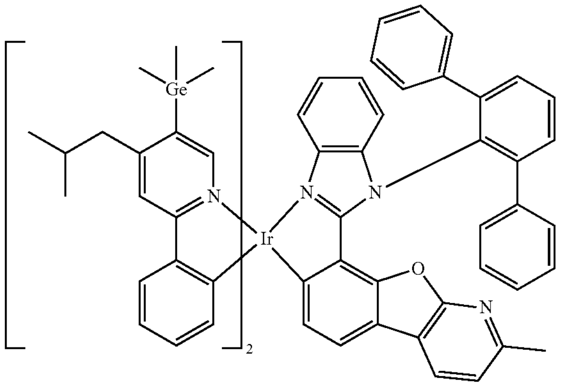
1528
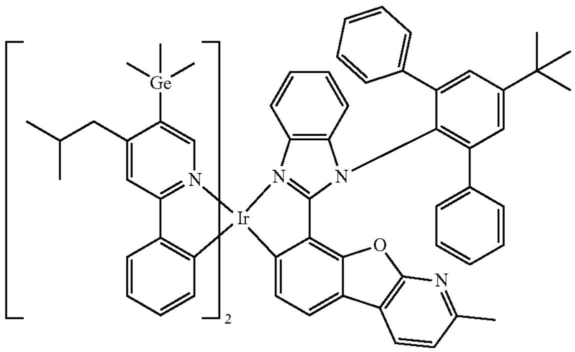
1529
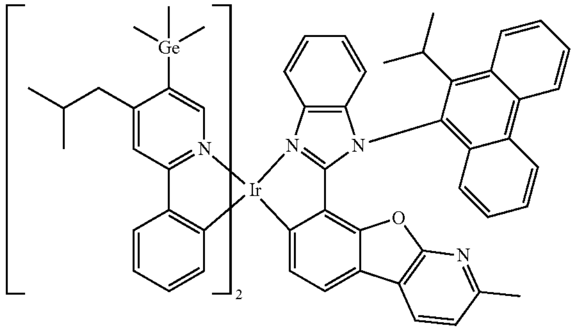
-continued
1530
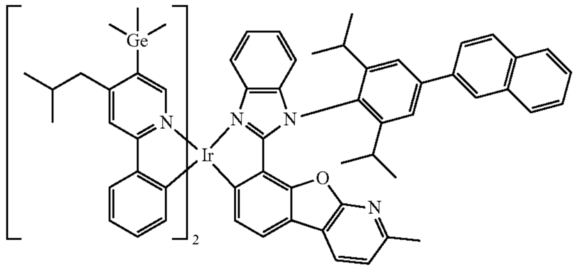
1531
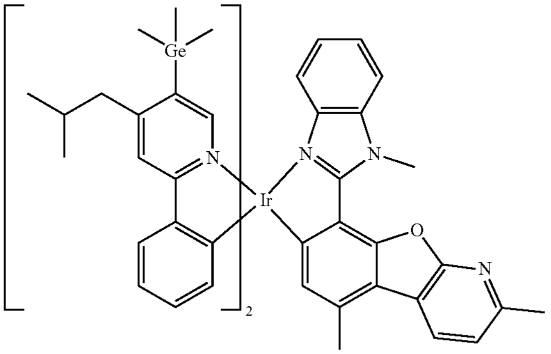
1532
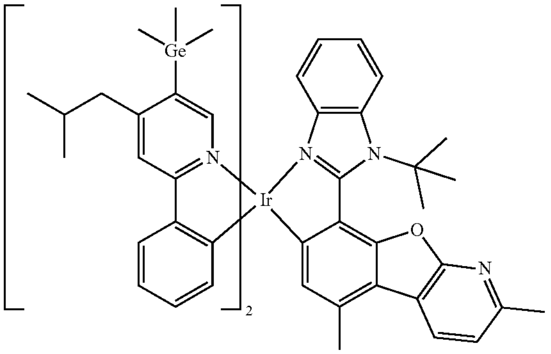
1533
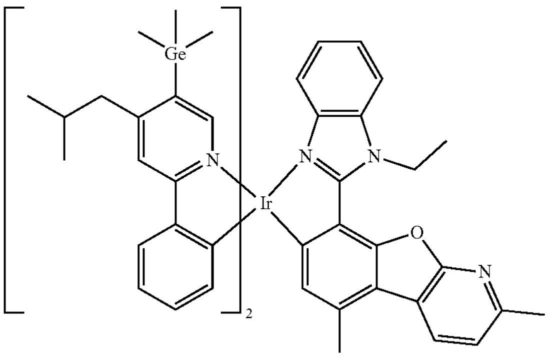

-continued
1534
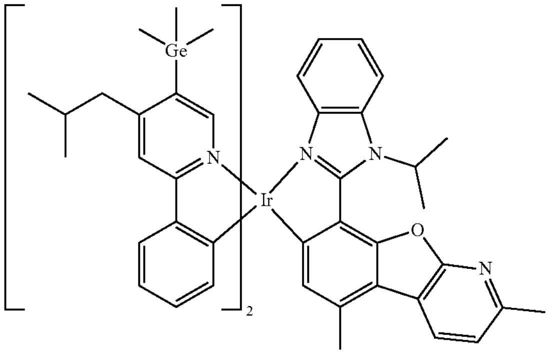
1535
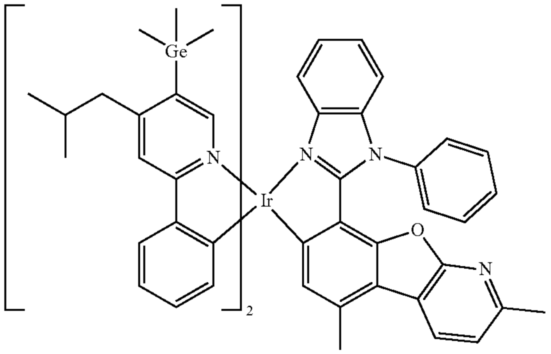
1536
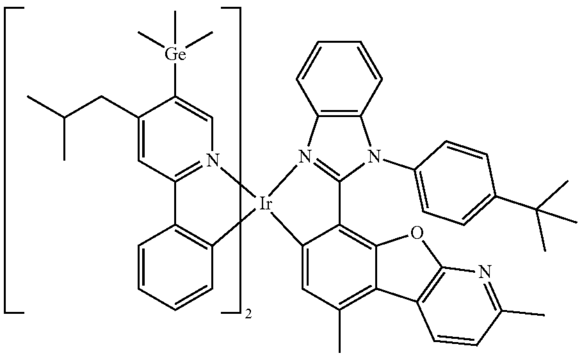
1537
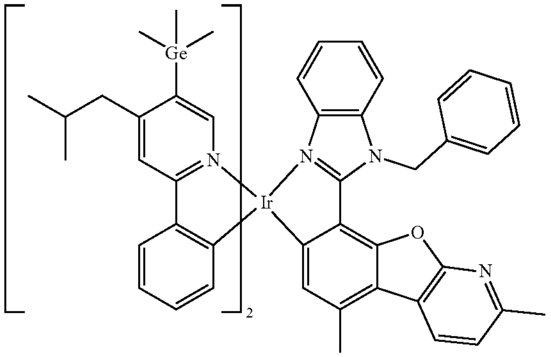
-continued
1538
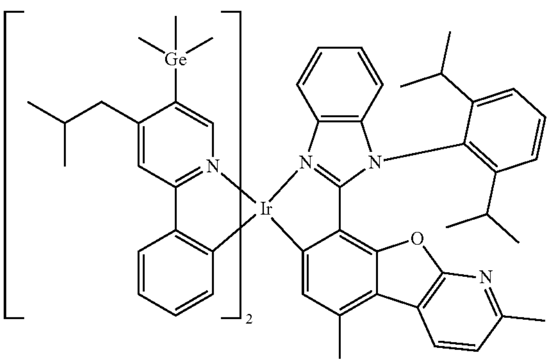
1539
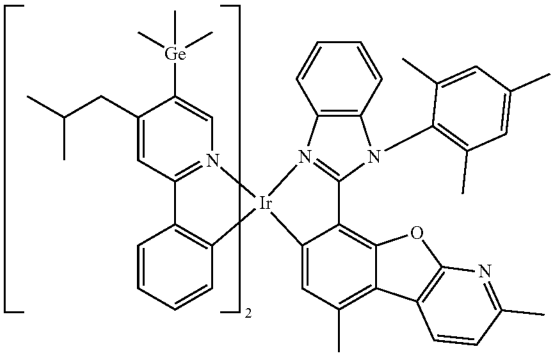
1540
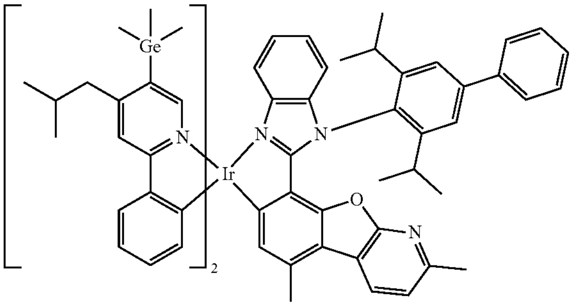
1541
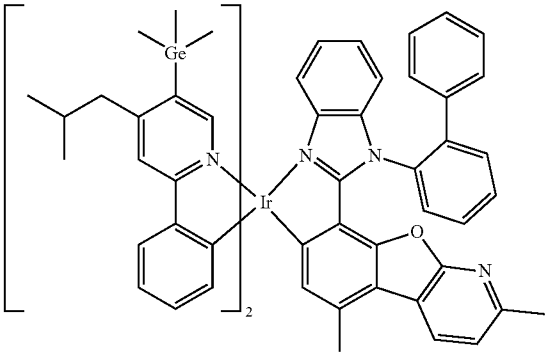

-continued
1542
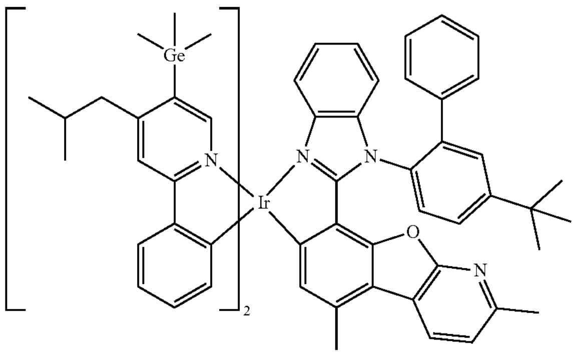
1543
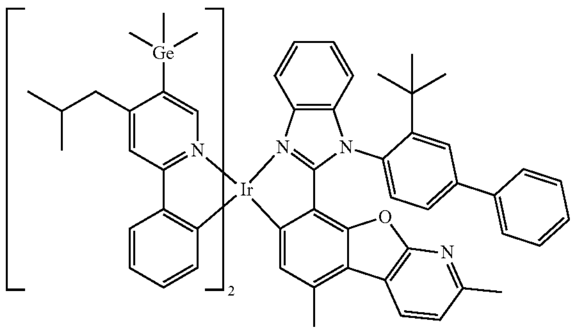
1544
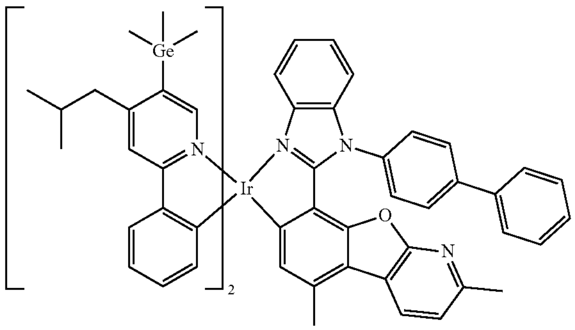
1545
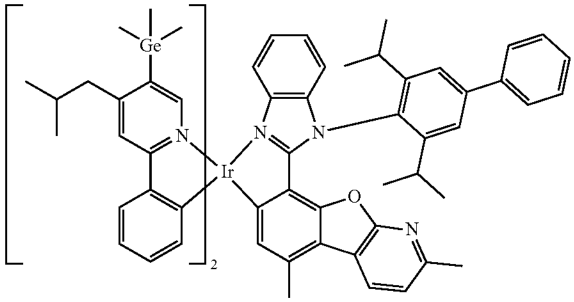
-continued
1546
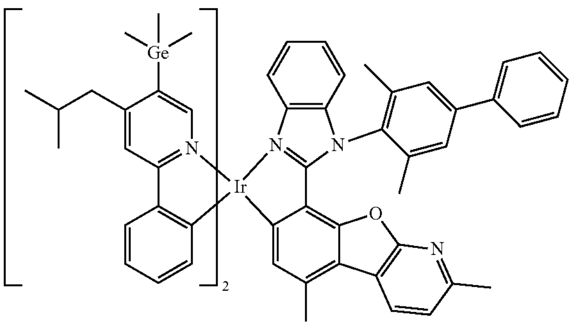
1547
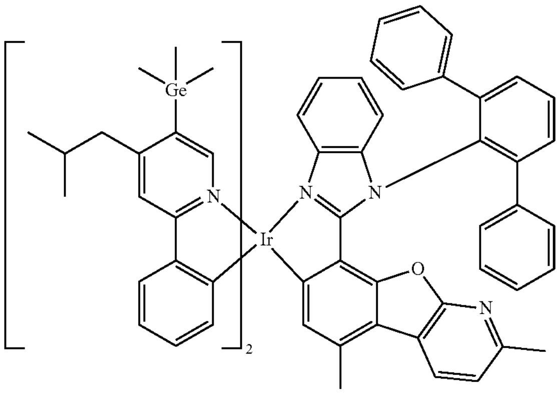
1548
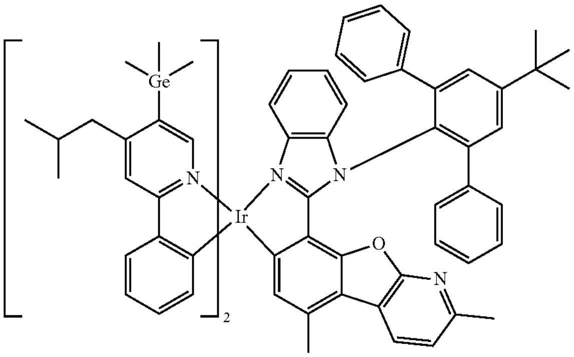
1549
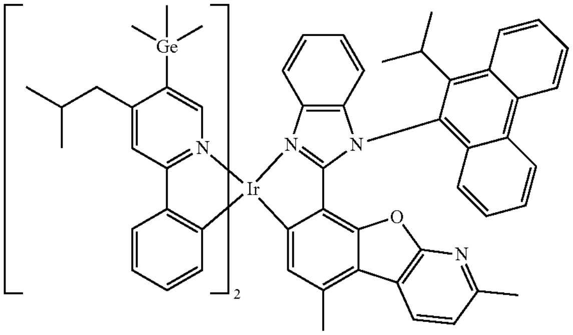

-continued
1550
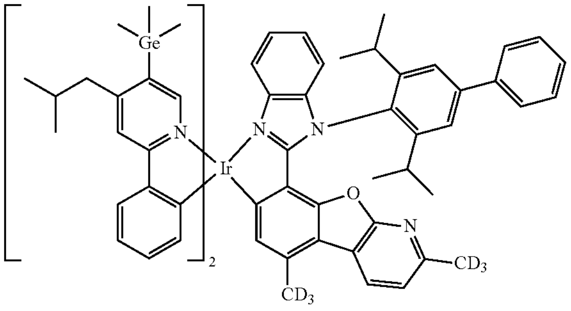
1551
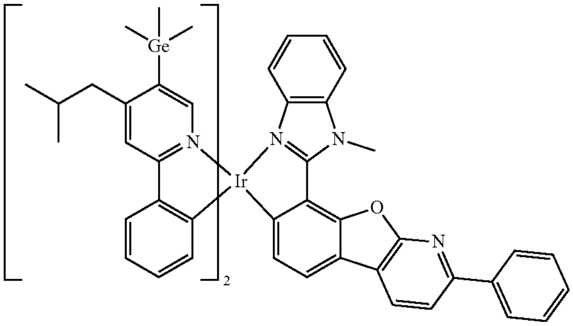
1552
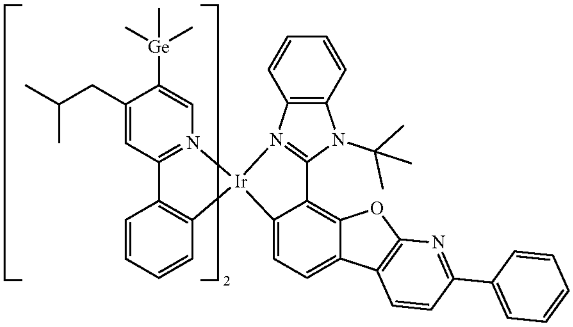
1553
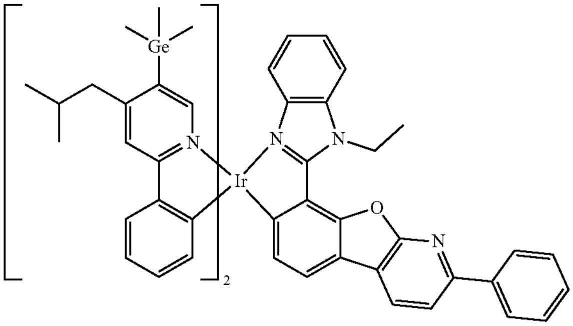
-continued
1554
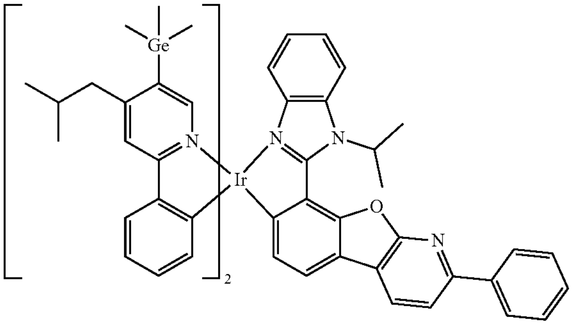
1555
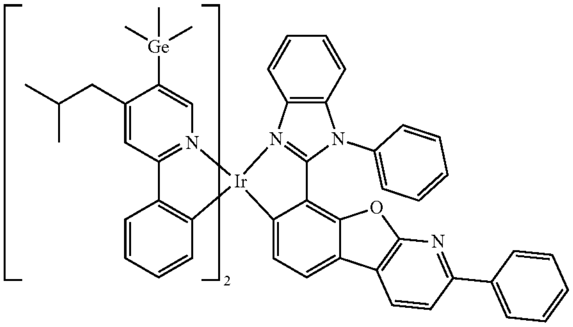
1556
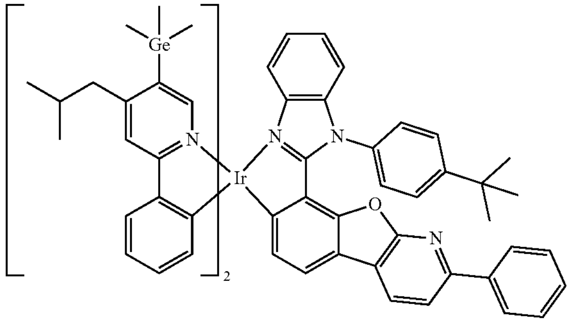
1557
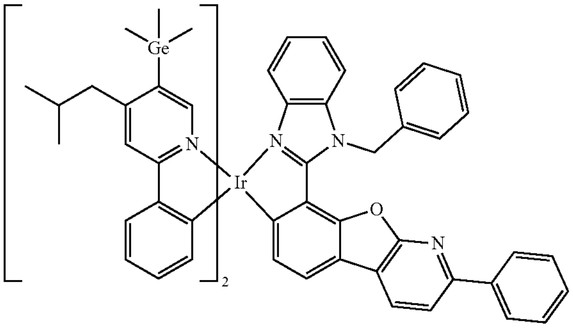

-continued
1558
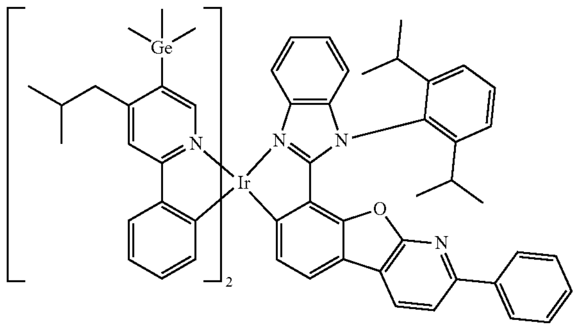
1559
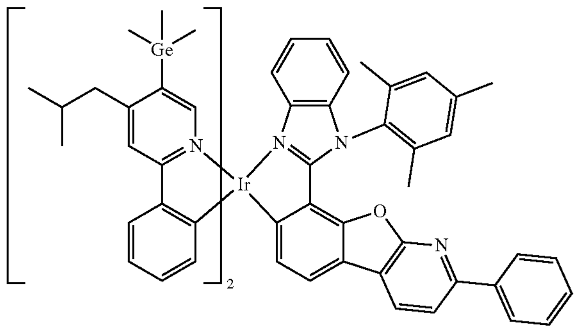
1560
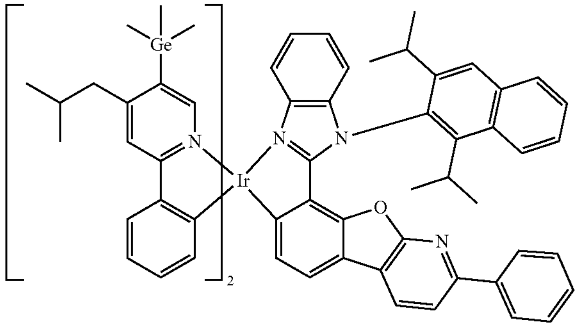
1561
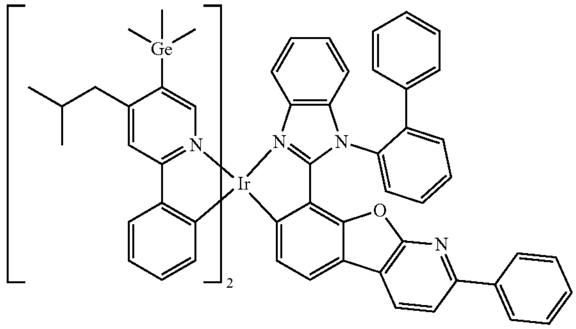
-continued
1562
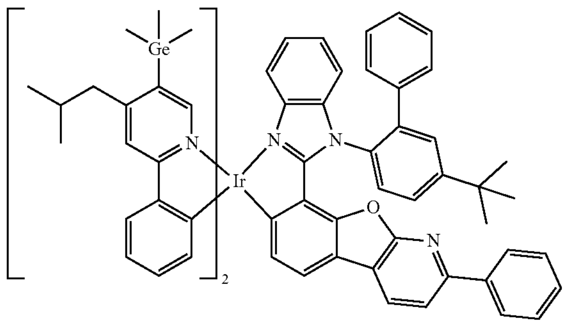
1563
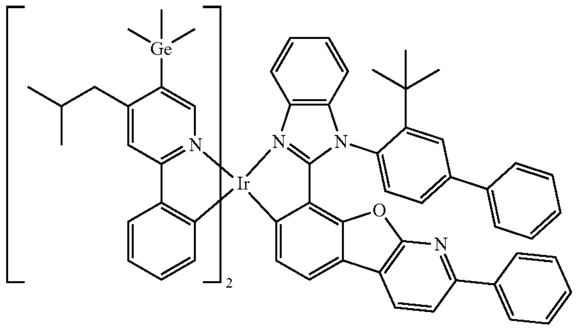
1564
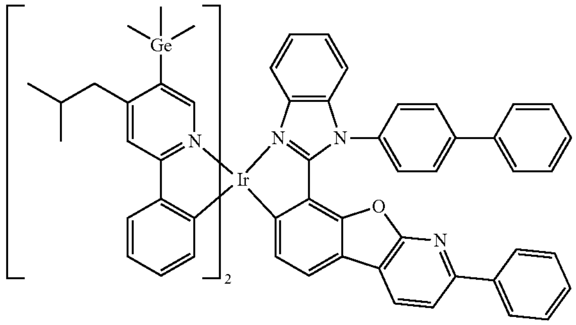
1565
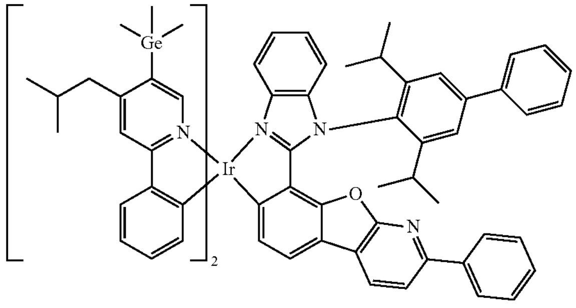

-continued
1566
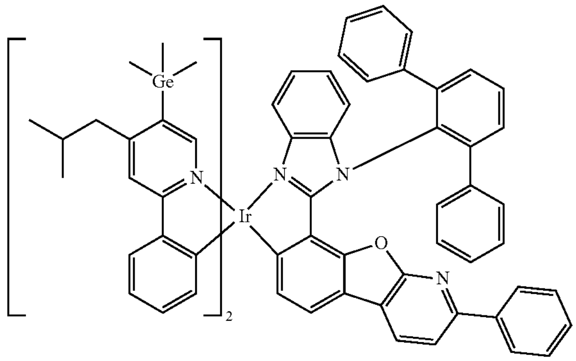
1567
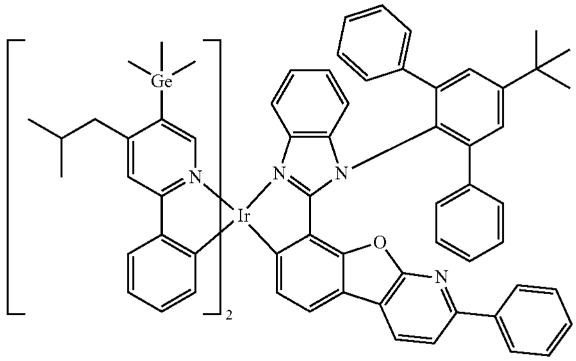
1568
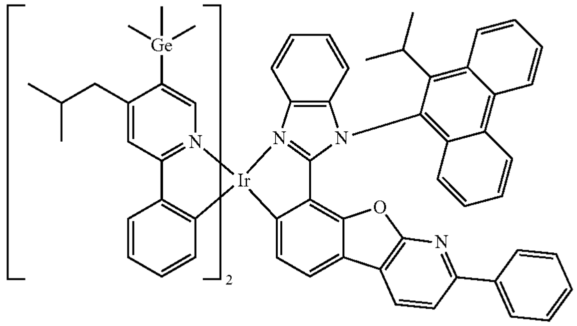
1569
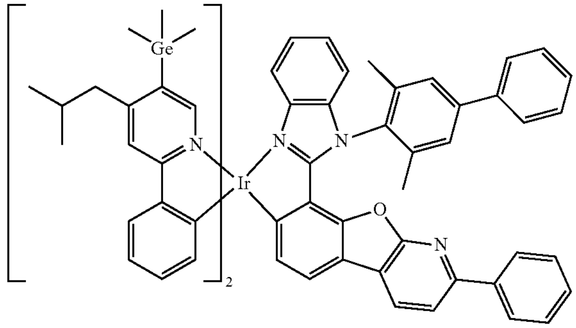
-continued
1570
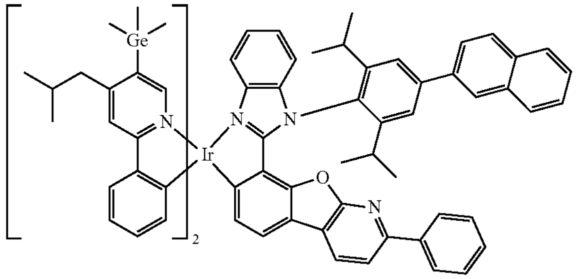
1571
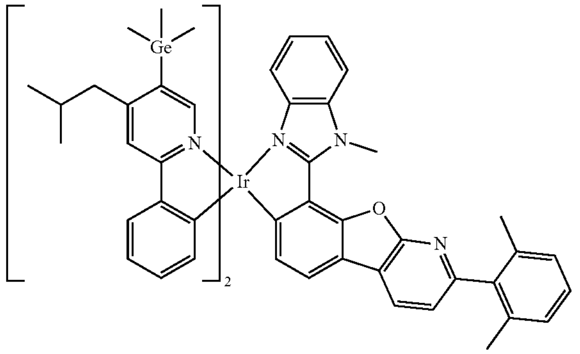
1572
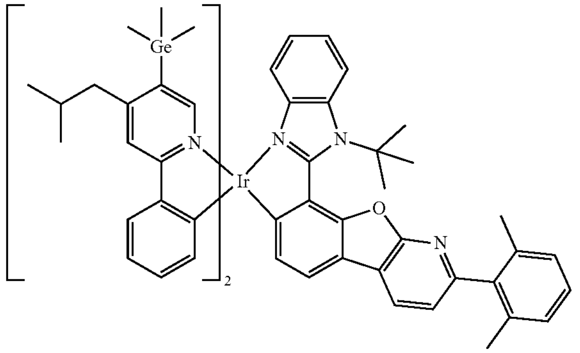
1573
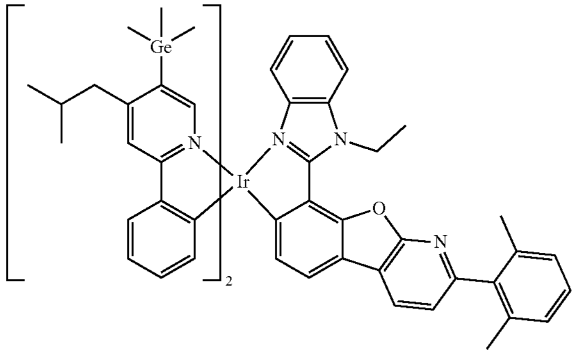

-continued
1574
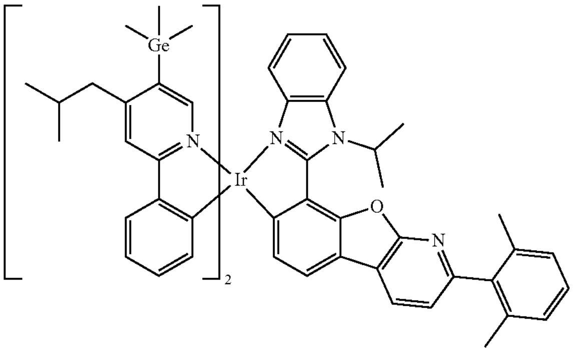
1575
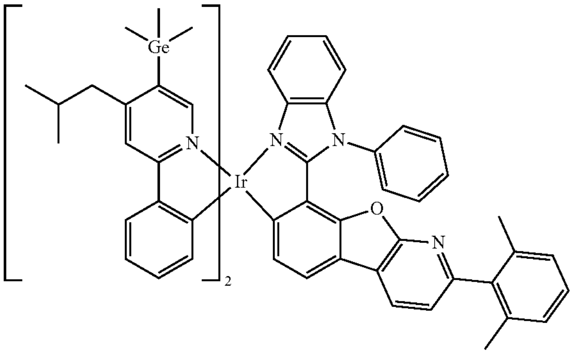
1576
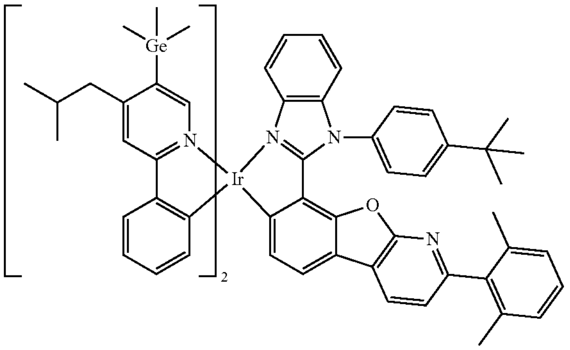
1577
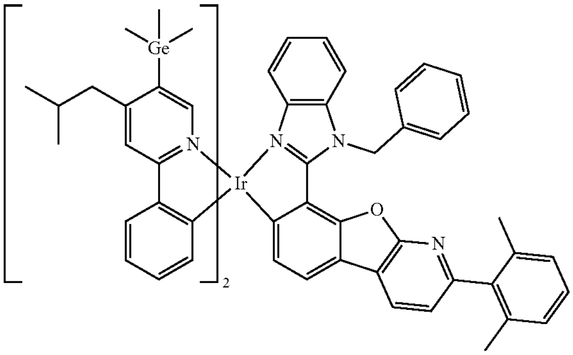
-continued
1578
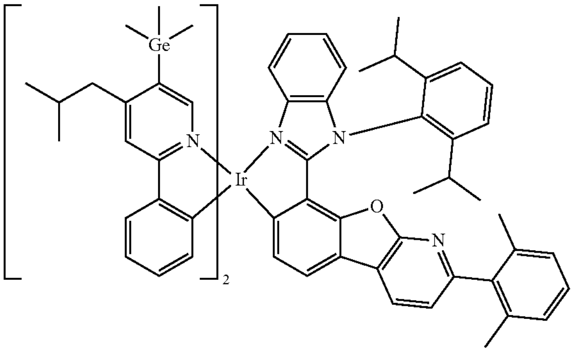
1579
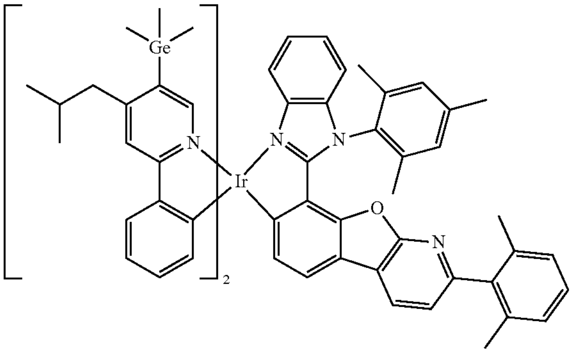
1580
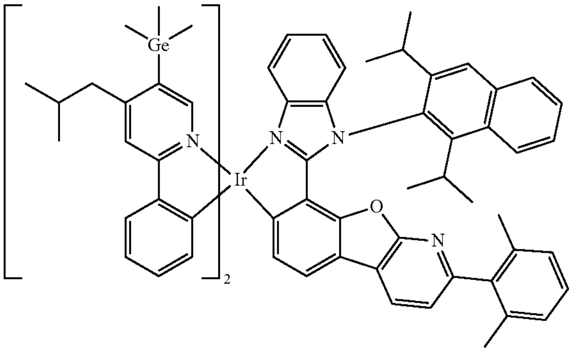
1581
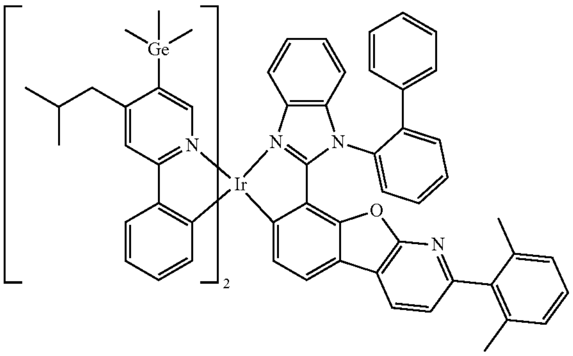

-continued
1582
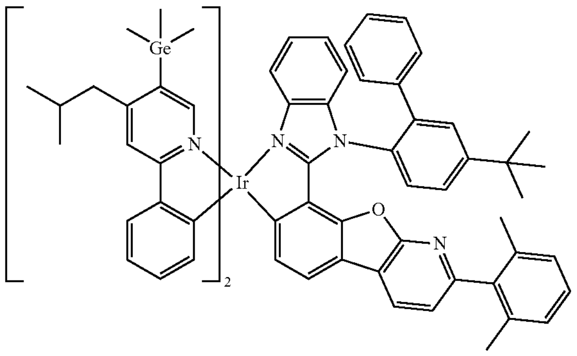
1583
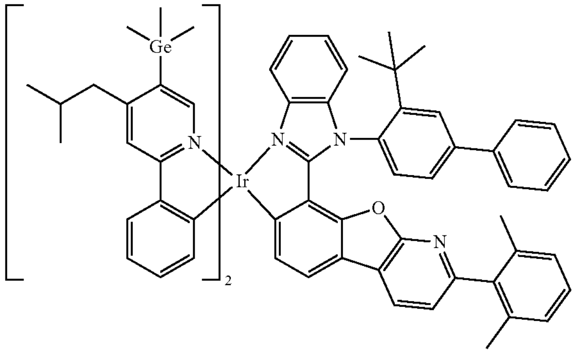
1584
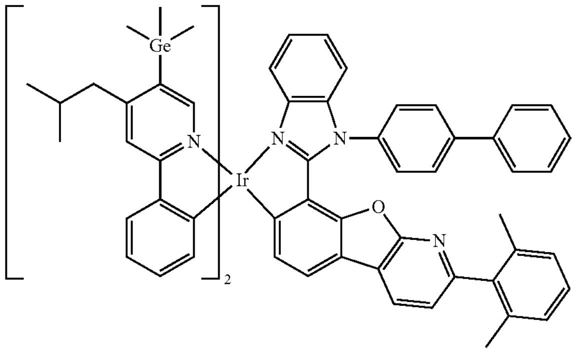
1585
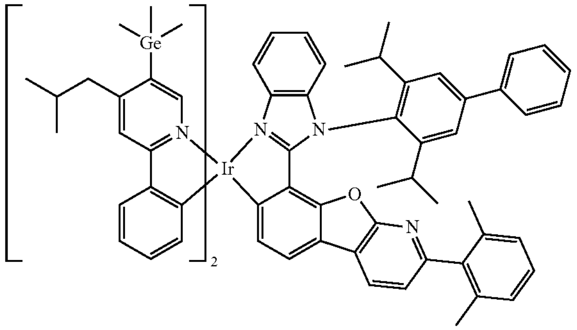
-continued
1586
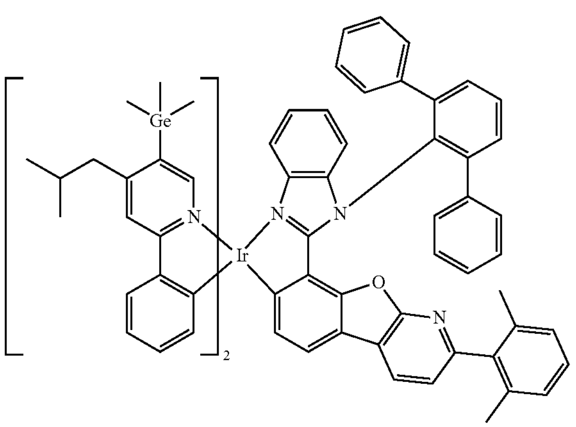
1587
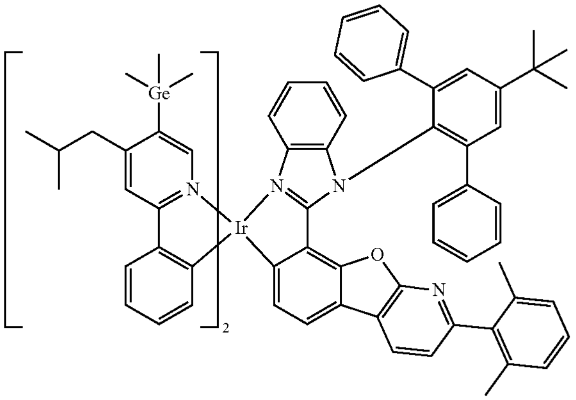
1588
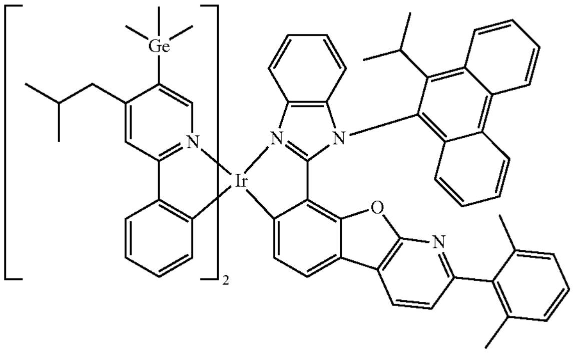
1589
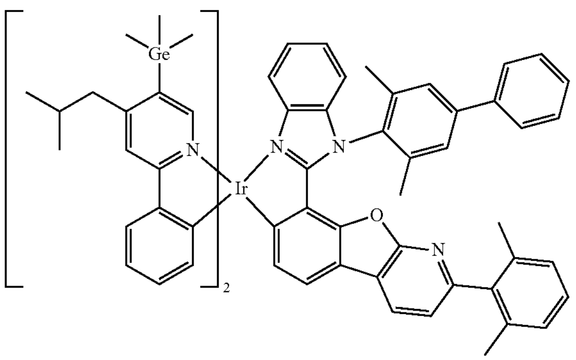

-continued
1590
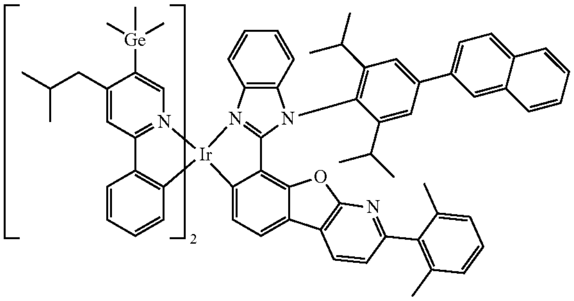
1591
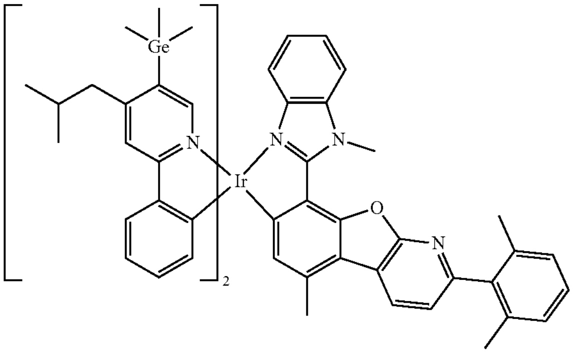
1592
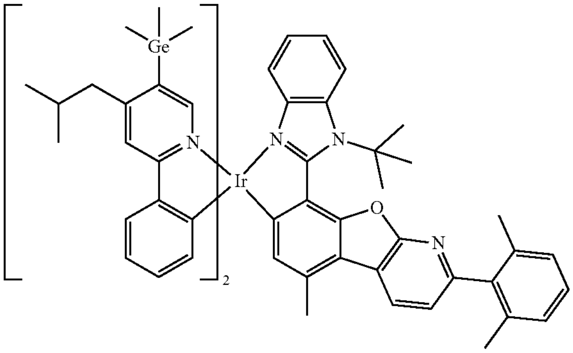
1593
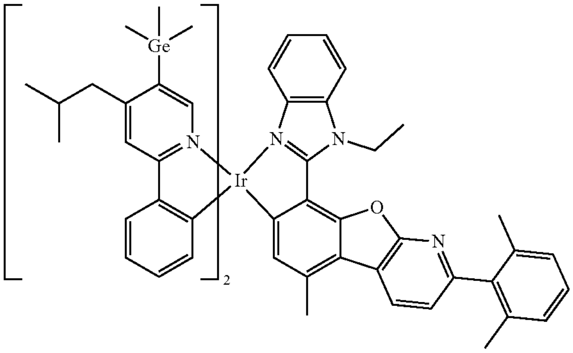
-continued
1594
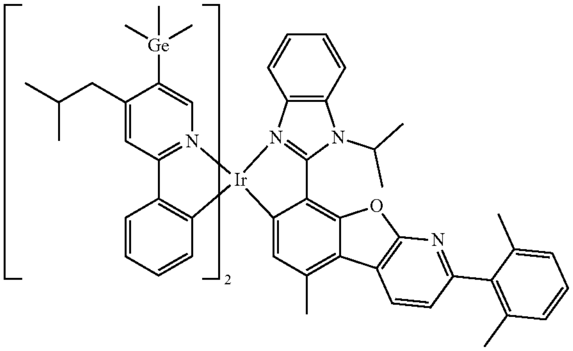
1595
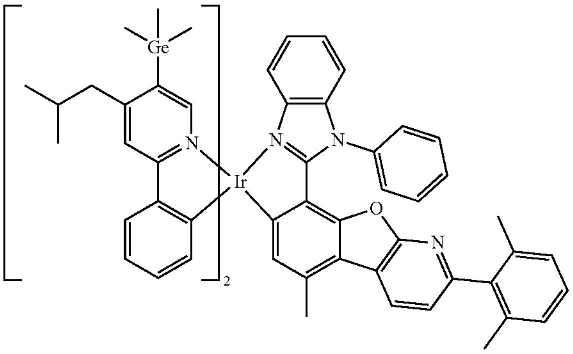
1596
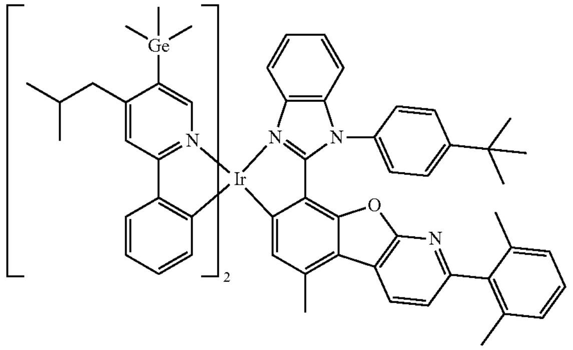
1597
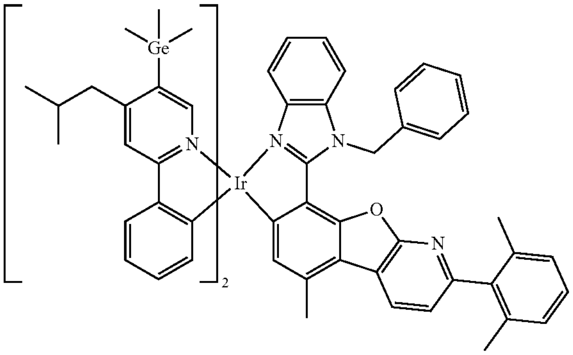

1598
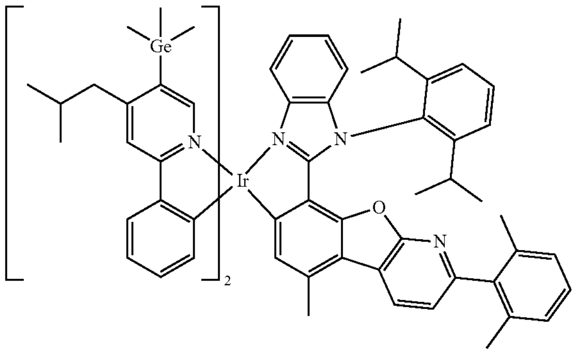
1599
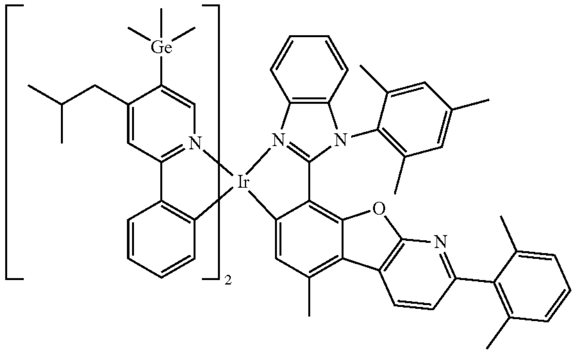
1600
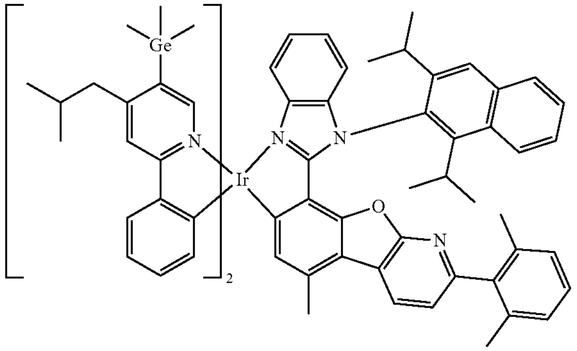
1601
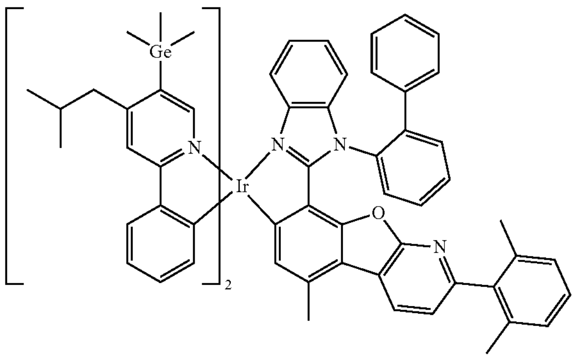
1602
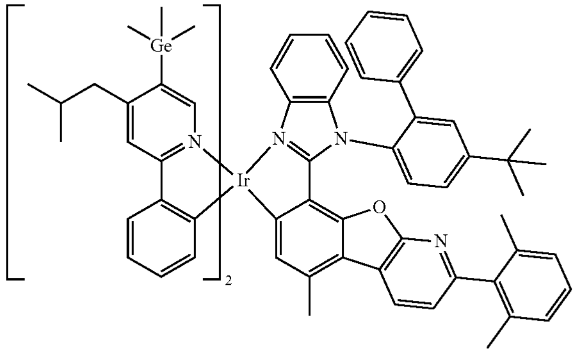
1603
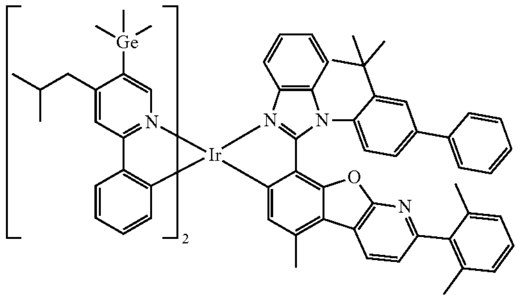
1604
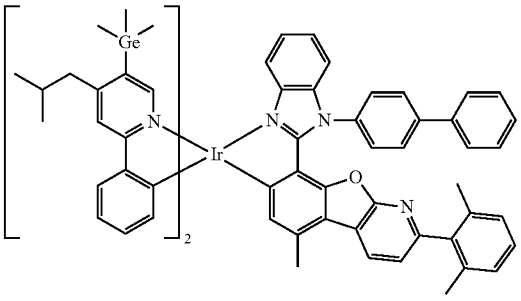
1605
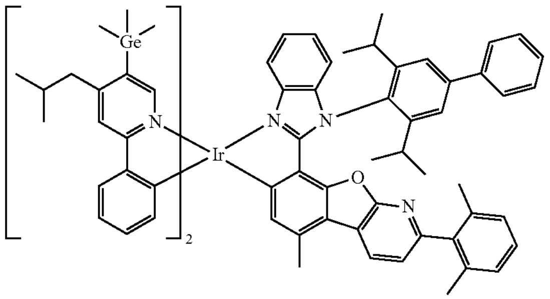

-continued
1606
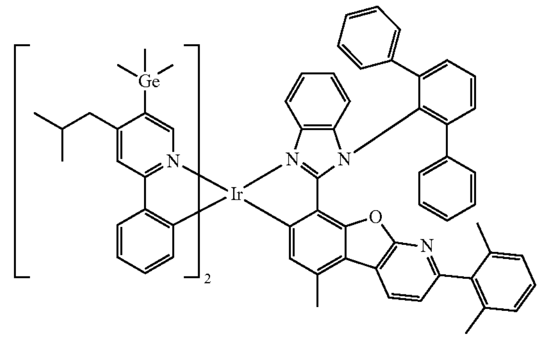
1607
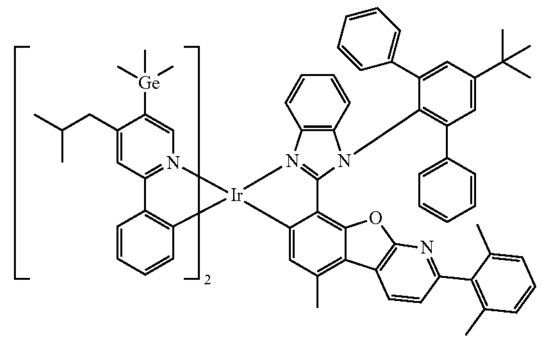
1608
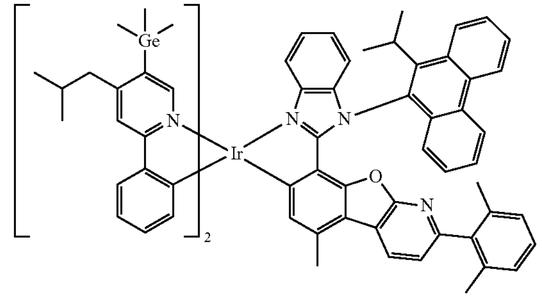
1609
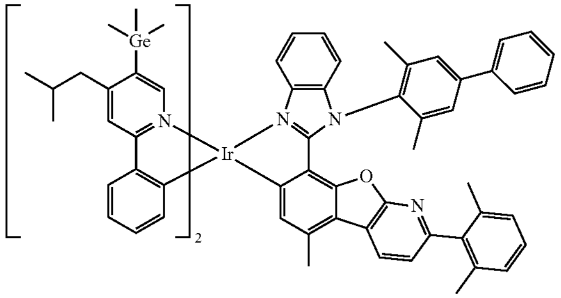
-continued
1610
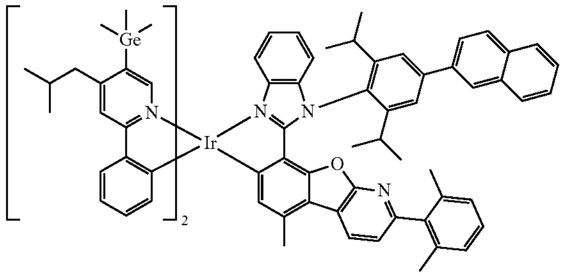
1611
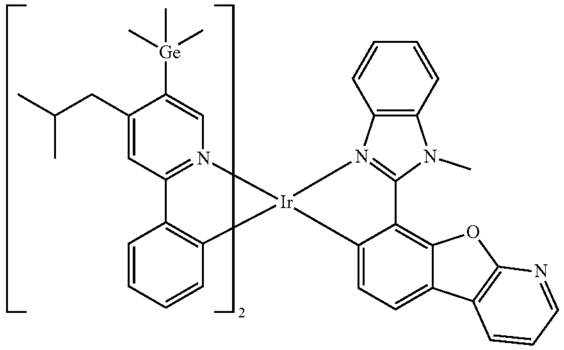
1612
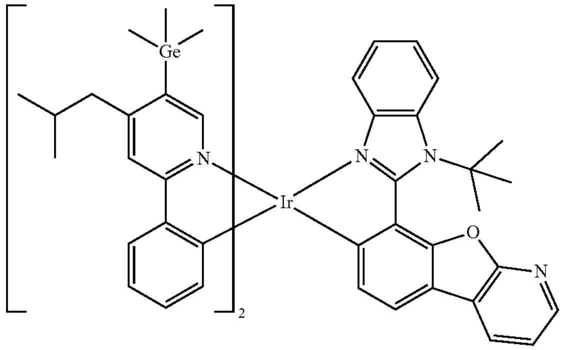
1613
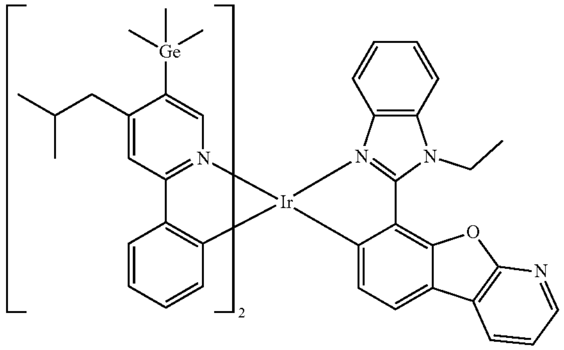

-continued
1614
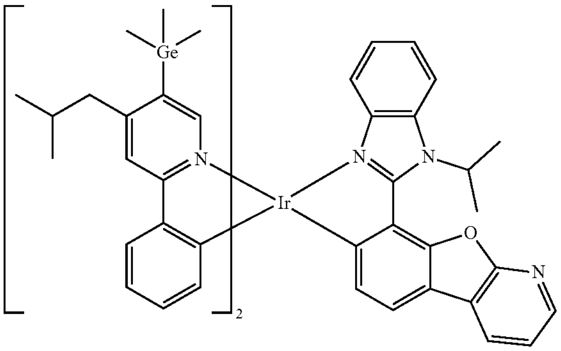
1615
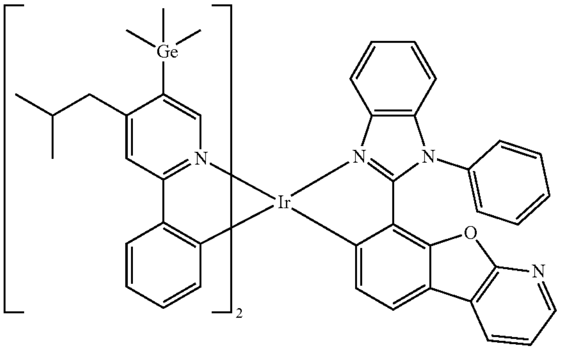
1616
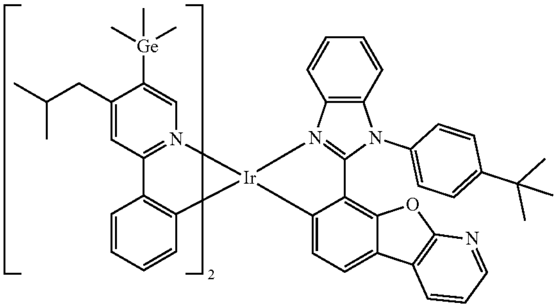
1617
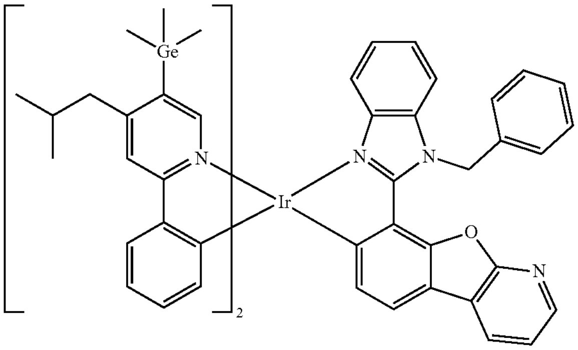
-continued
1618
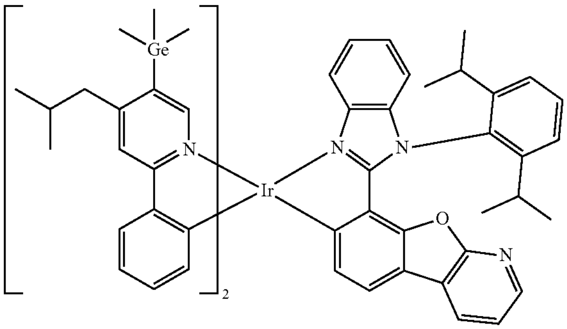
1619
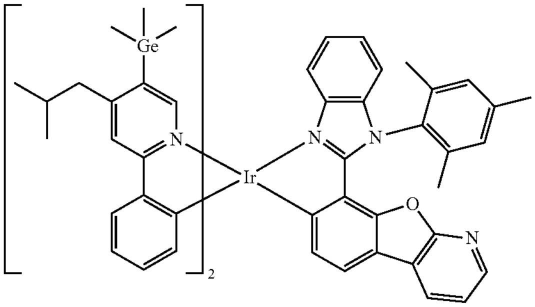
1620
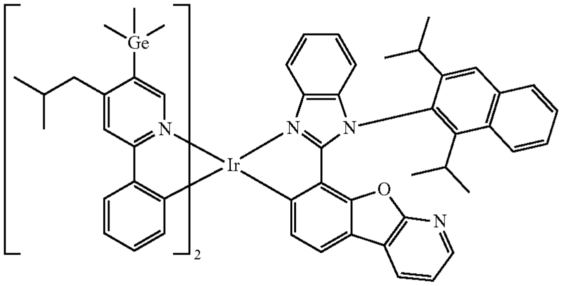
1621
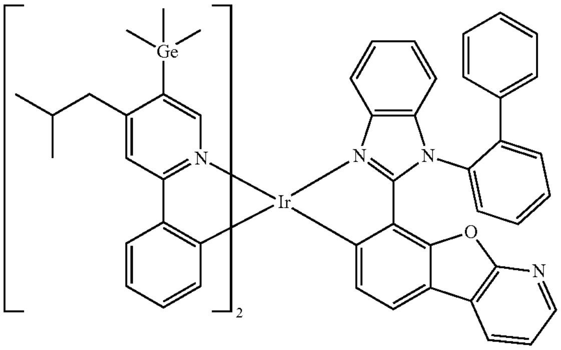

-continued
1622
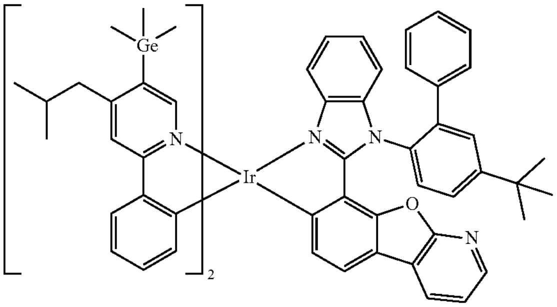
1623
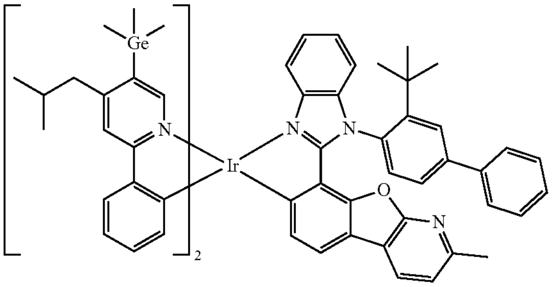
1624
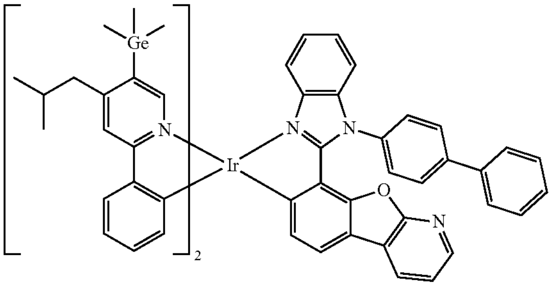
1625
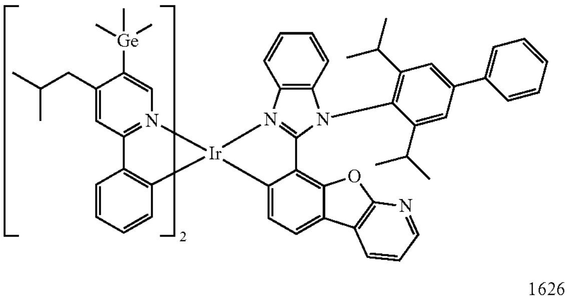
1626
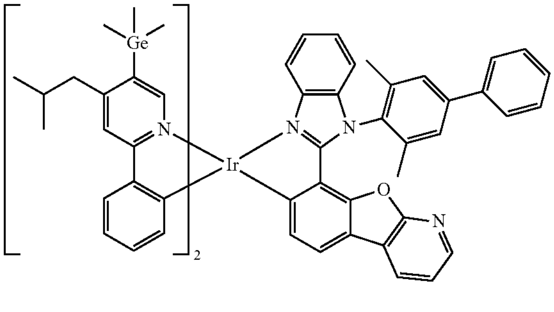
-continued
1627
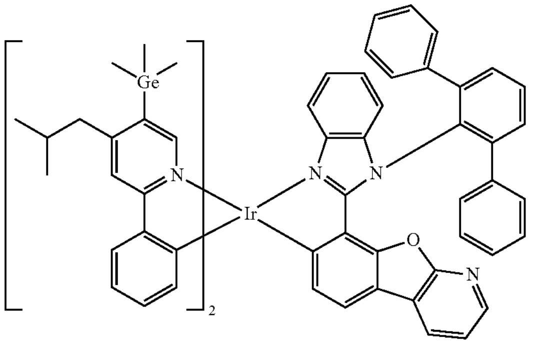
1628
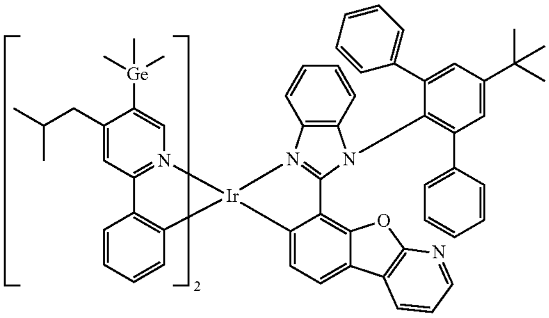
1629
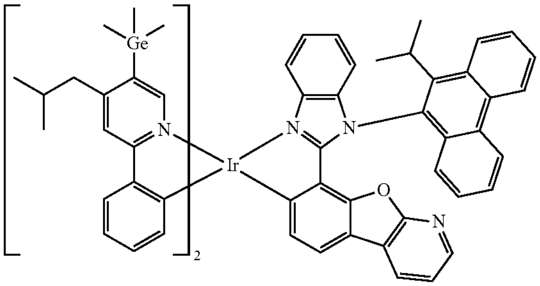
1630
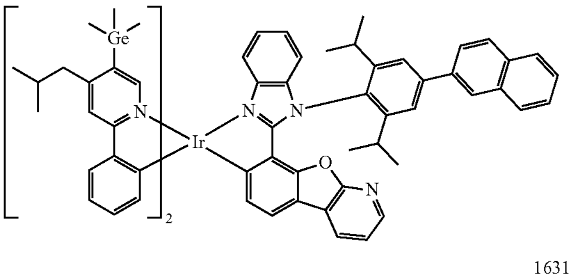
1631
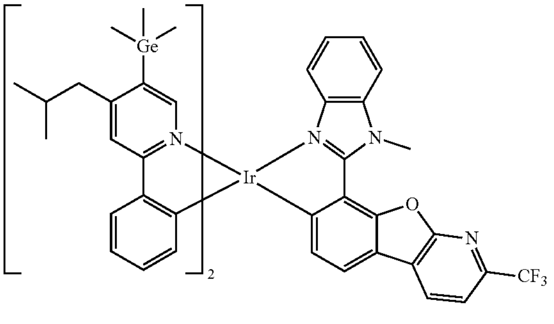

-continued
1632
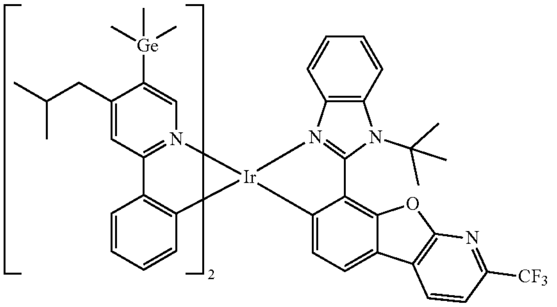
1633
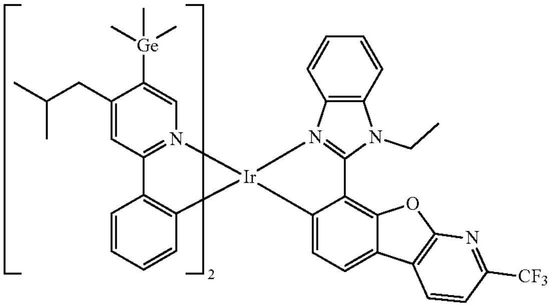
1634
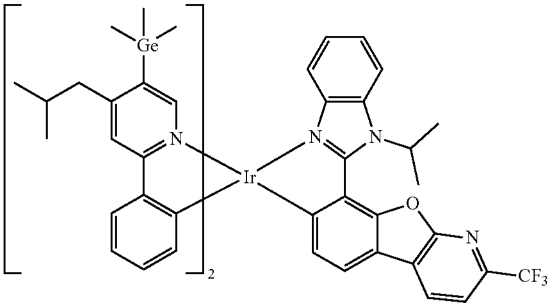
1635
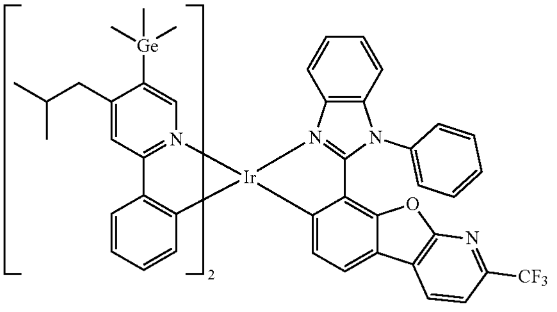
-continued
1636
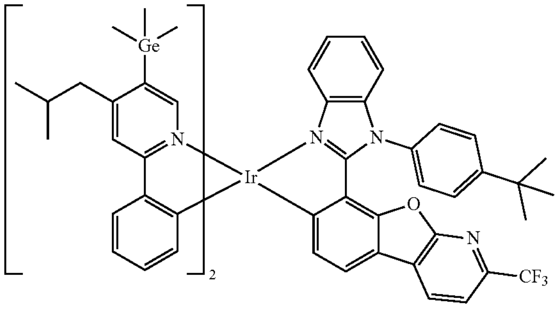
1637
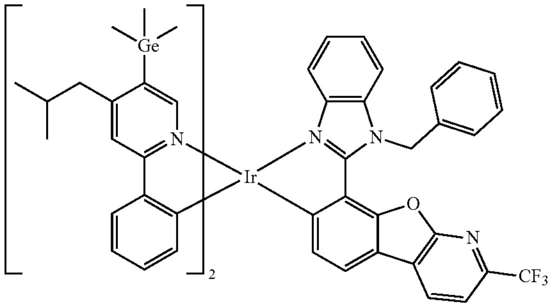
1638
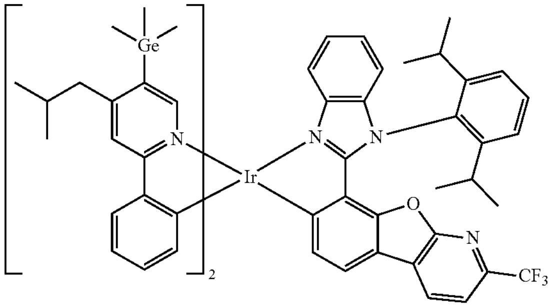
1639
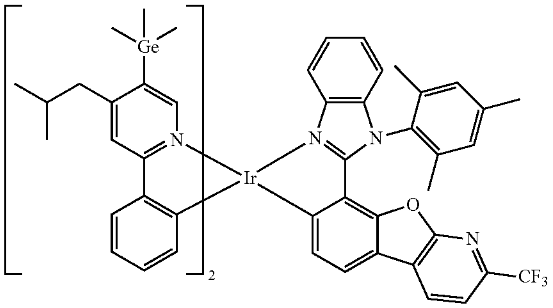
1640
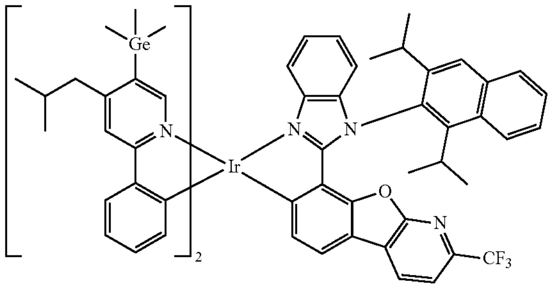

-continued
1641
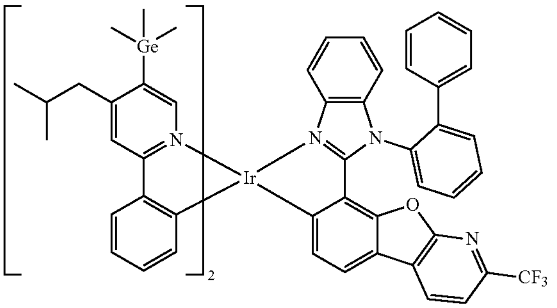
1642
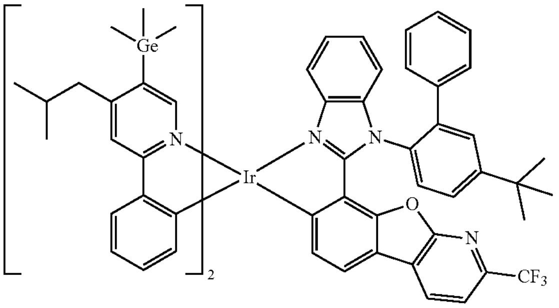
1643
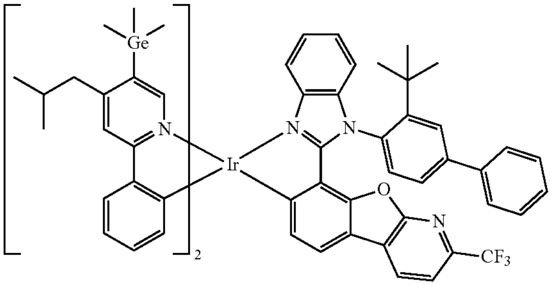
1644
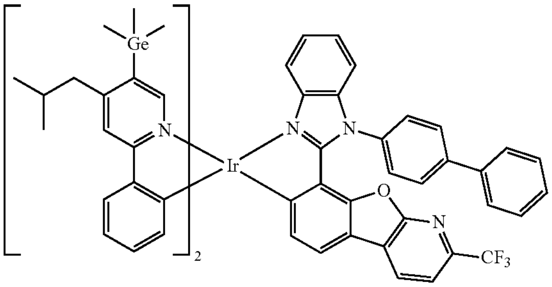
1645
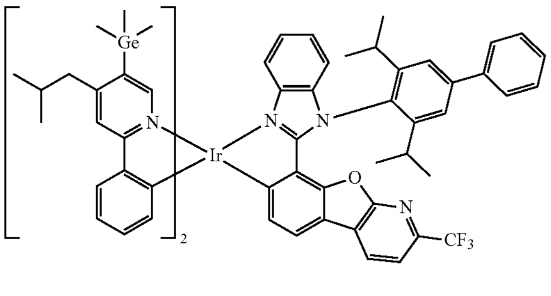
-continued
1646
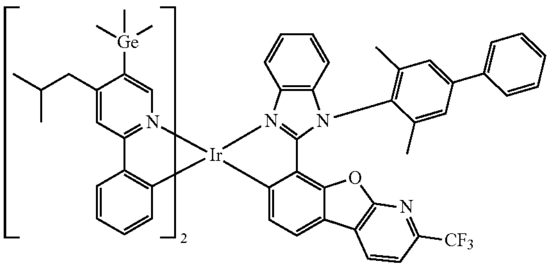
1647
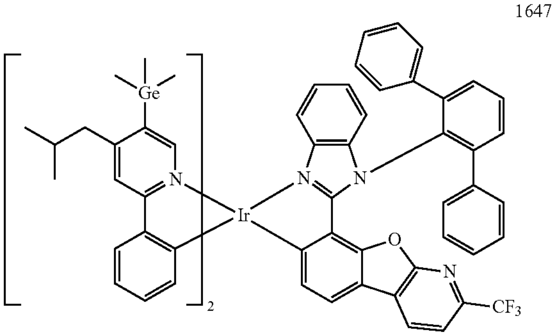
1648
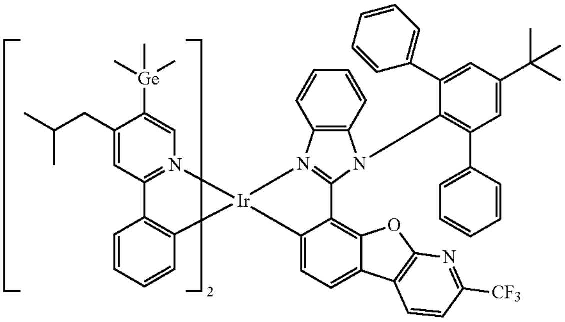
1649
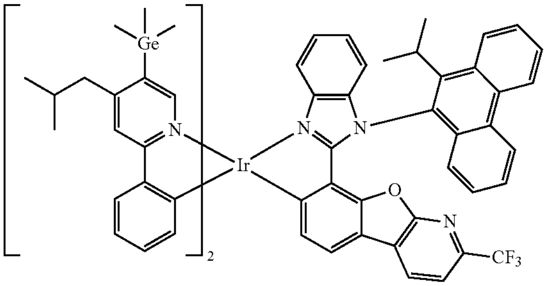
1650
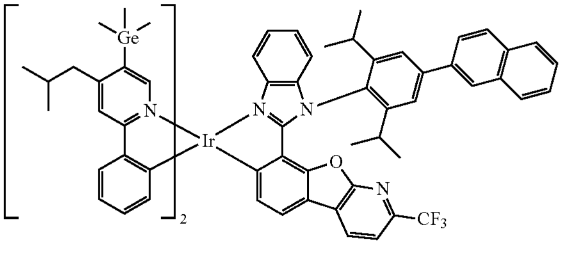

-continued
1651
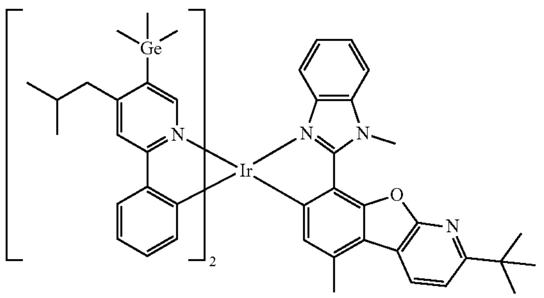
1652
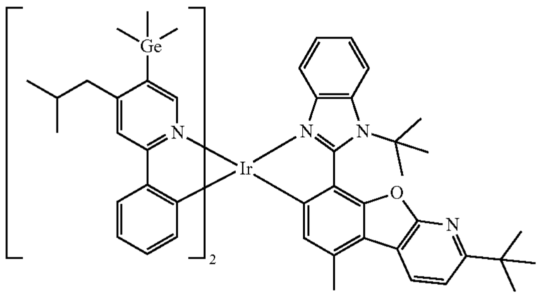
1653
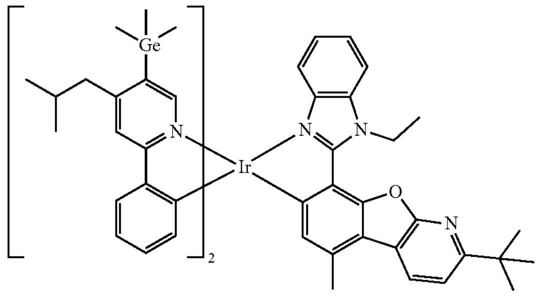
1654
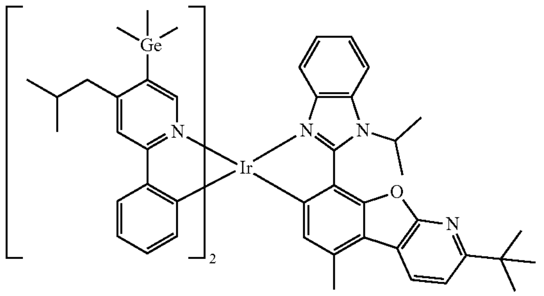
1655
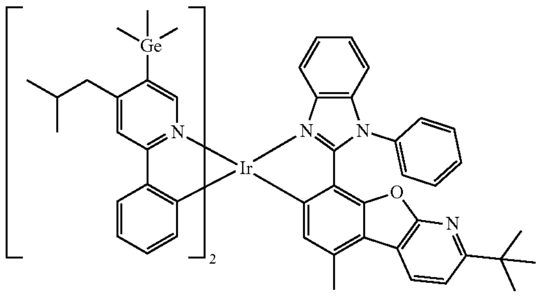
-continued
1656
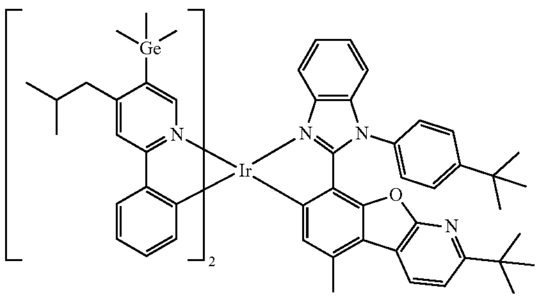
1657
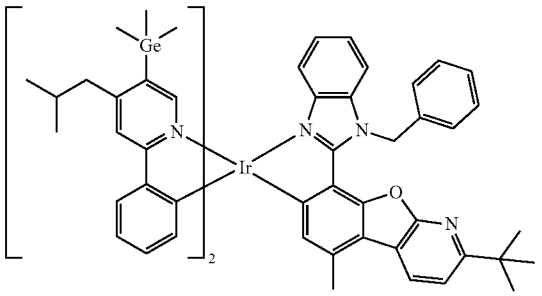
1658
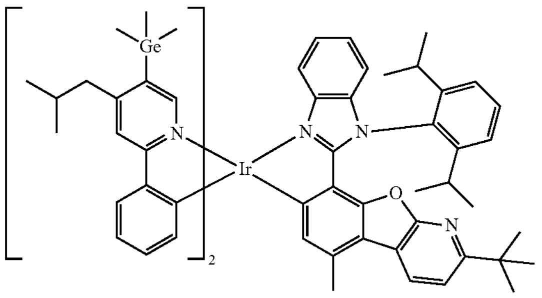
1659
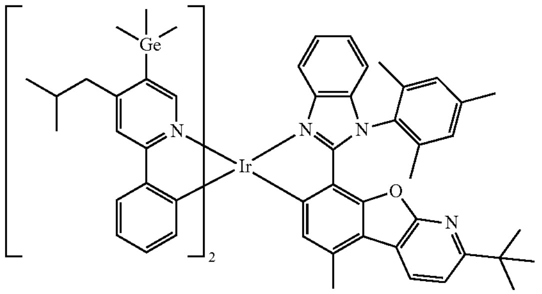
1660
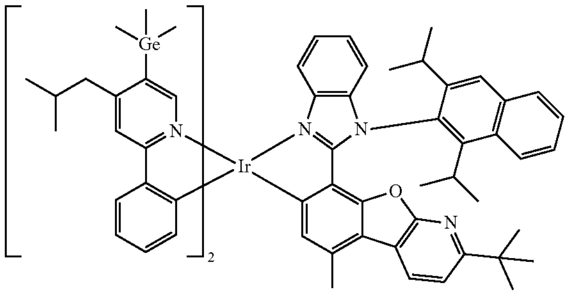

1661
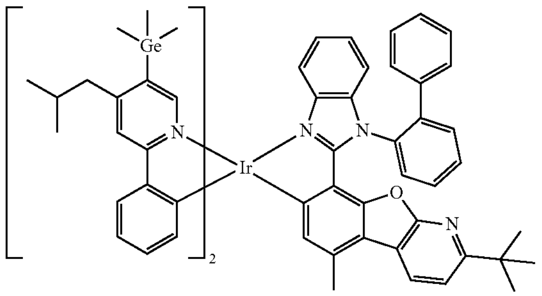
1662
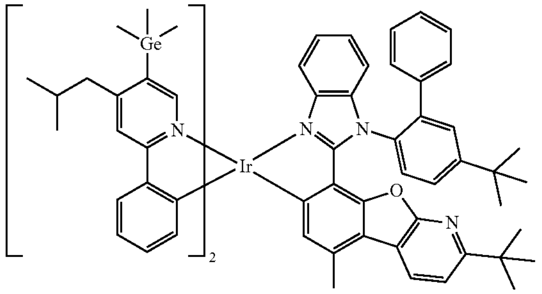
1663
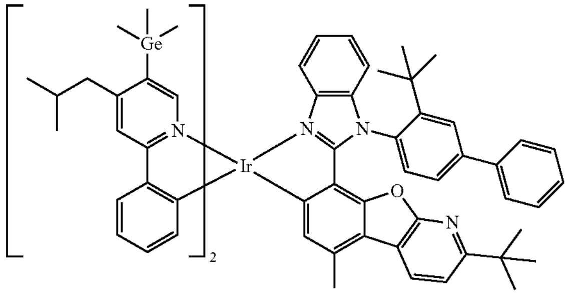
1664
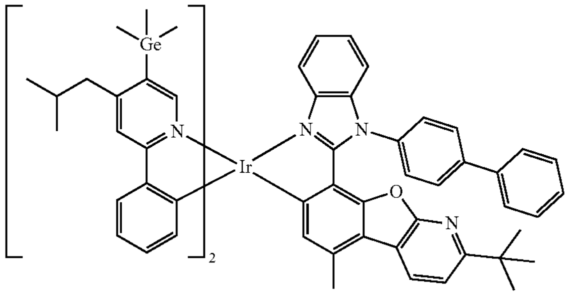
1665
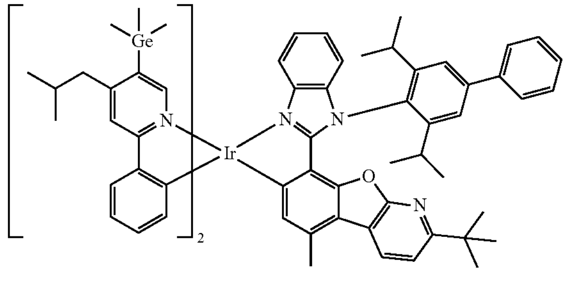
1666
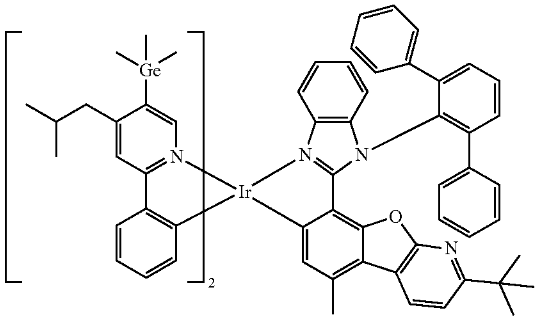
1667
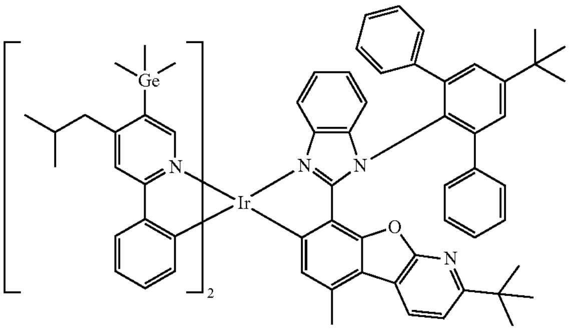
1668
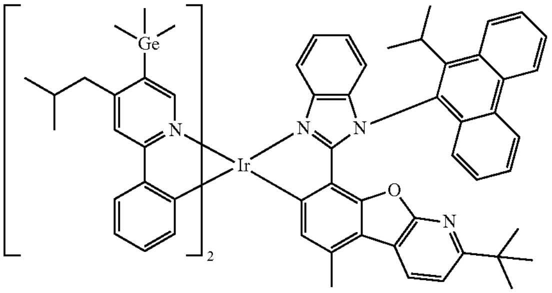
1669
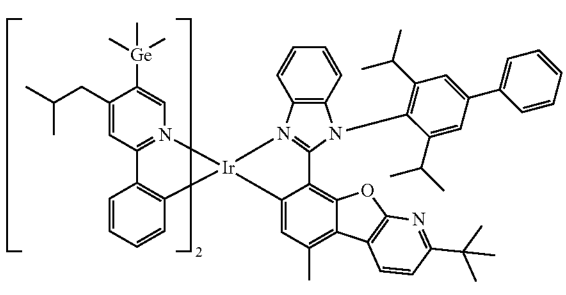
1670
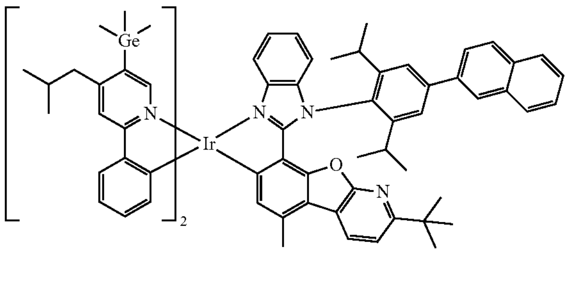

1671
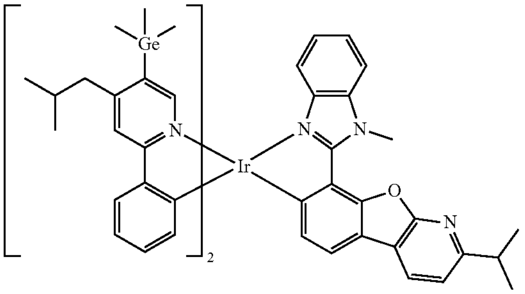
1672
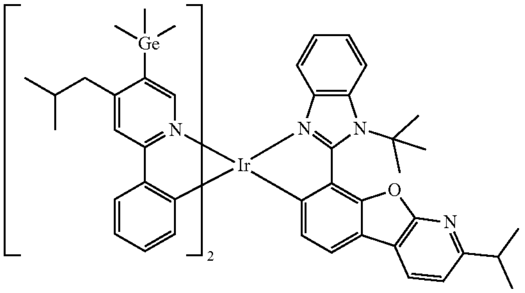
1673
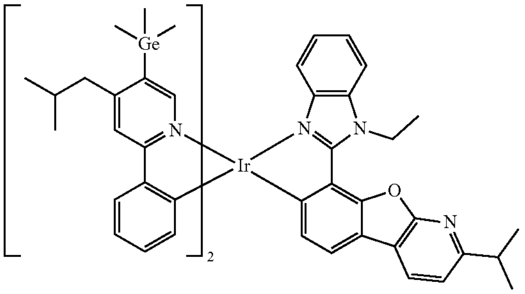
1674
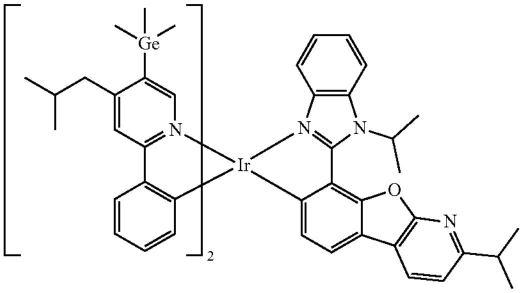
1675
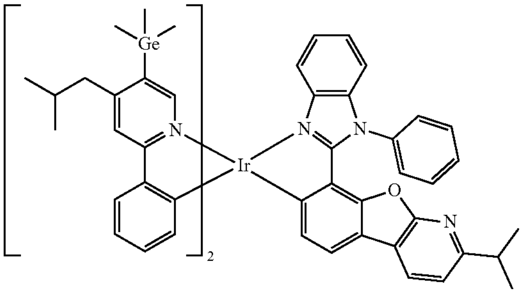
1676
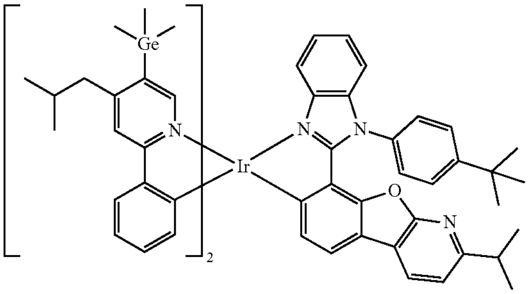
1677
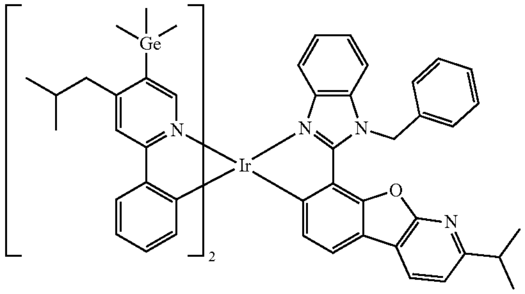
1678
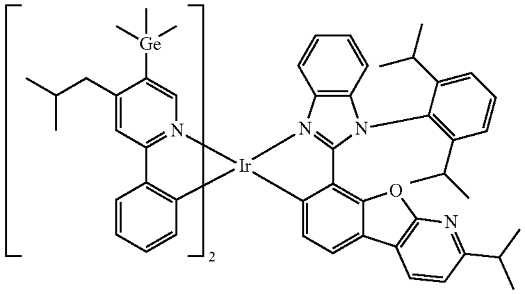
1679
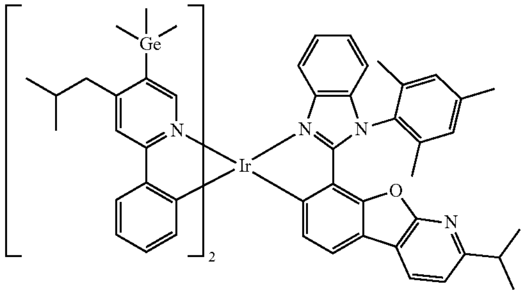
1680
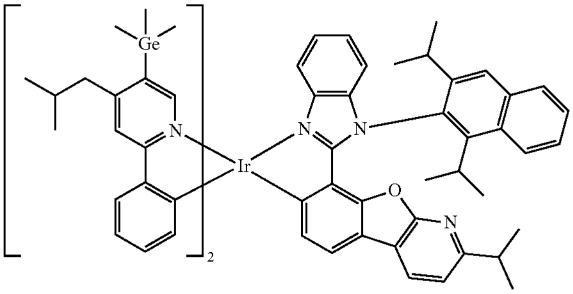

-continued
1681
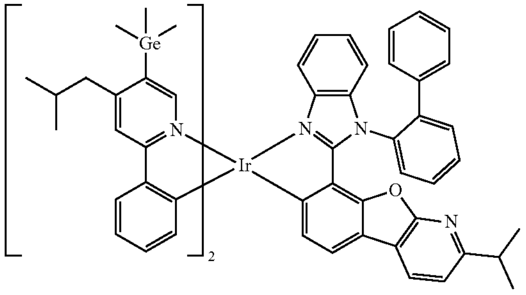
1682
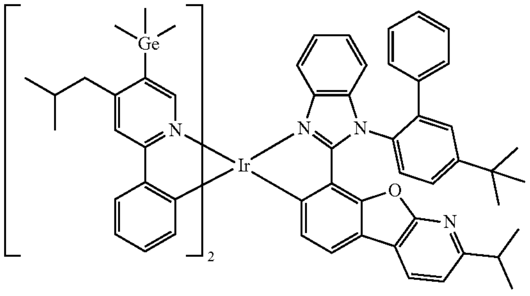
1683
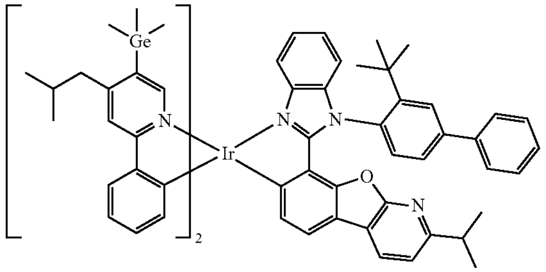
1684
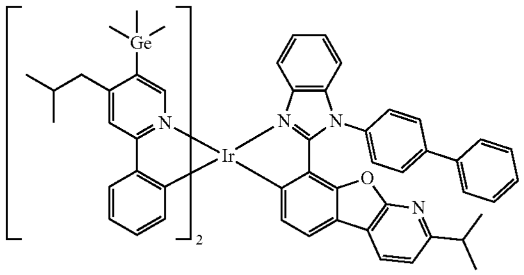
1685
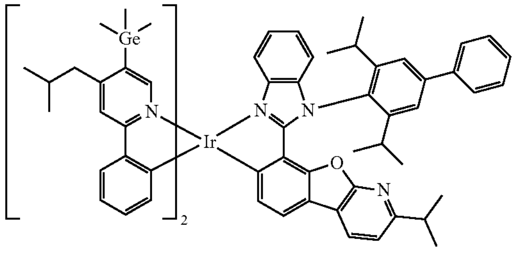
-continued
1686
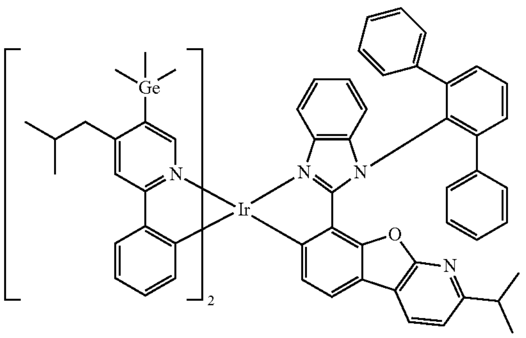
1687
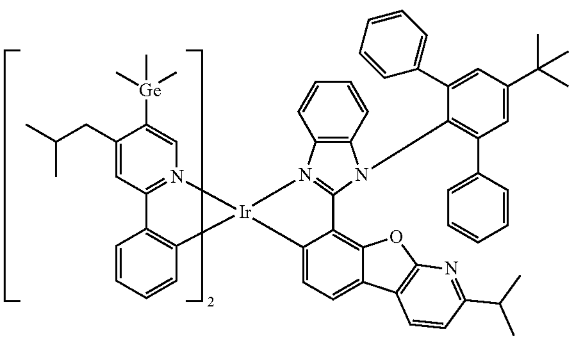
1688
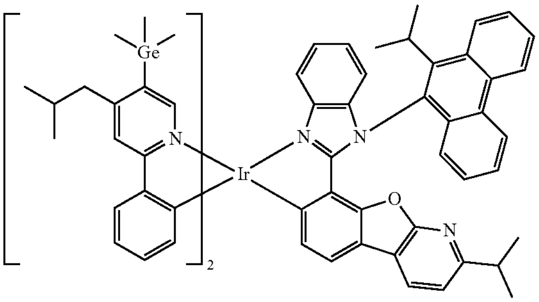
1689
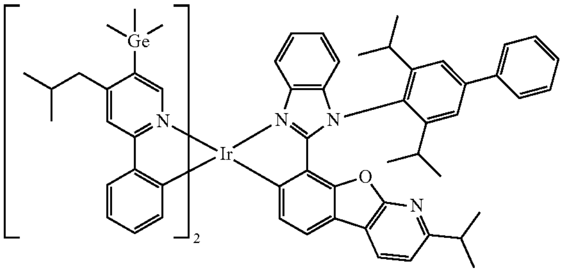
1690
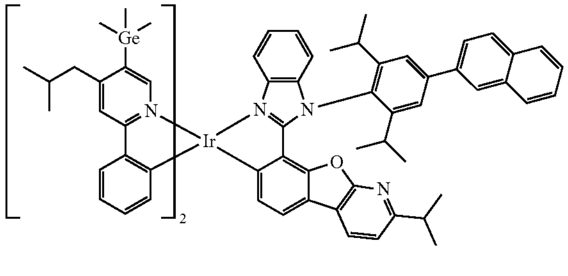

-continued
1691
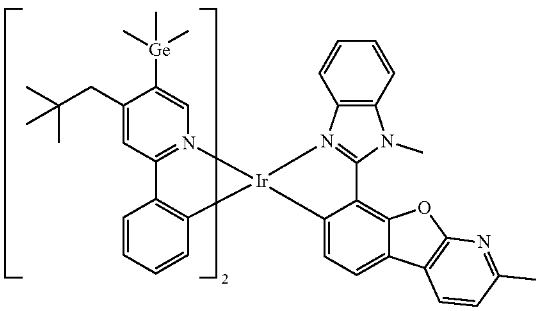
1692
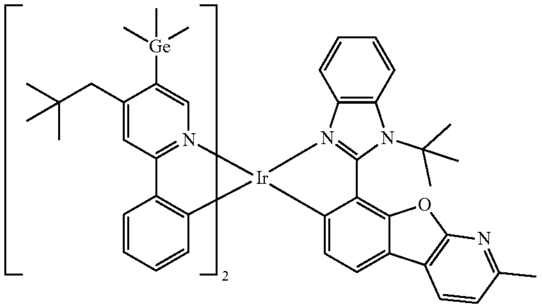
1693
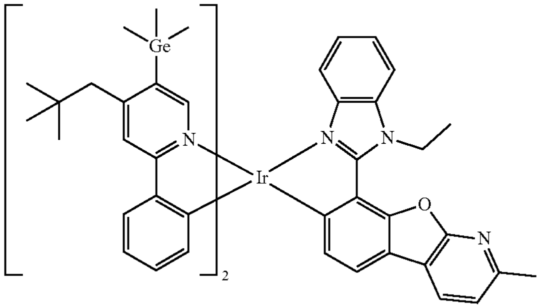
1694
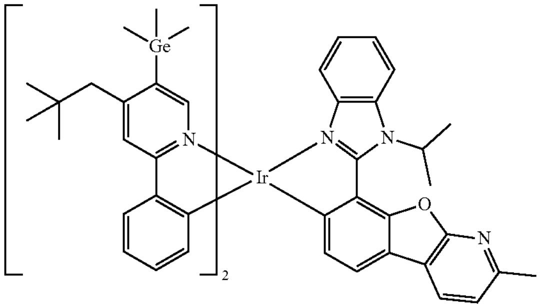
-continued
1695
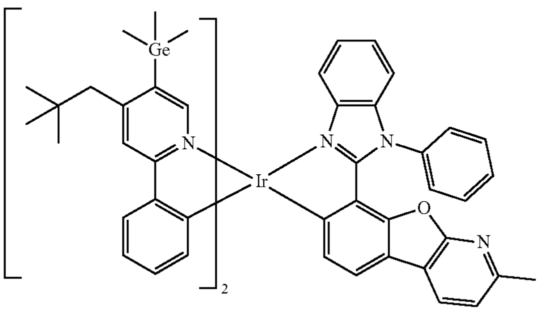
1696
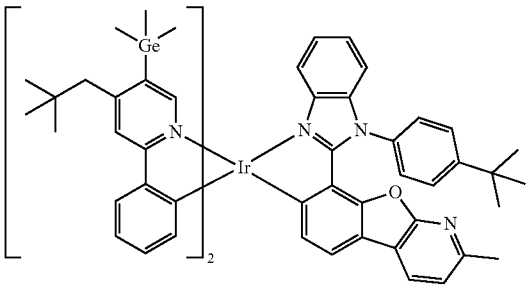
1697
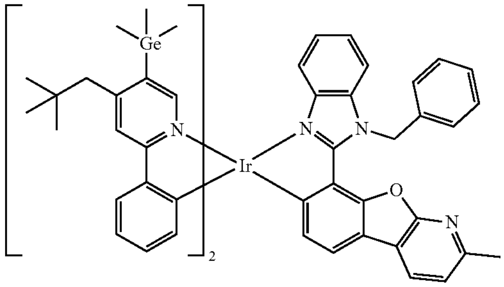
1698
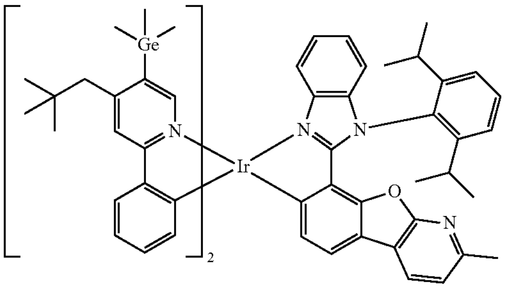
1699
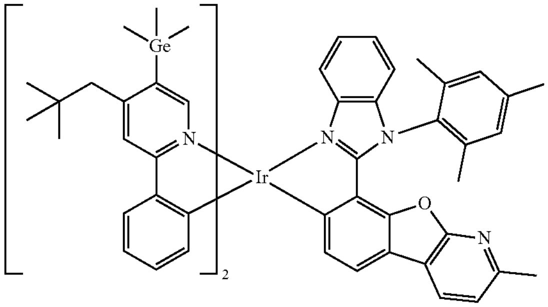

-continued
1700
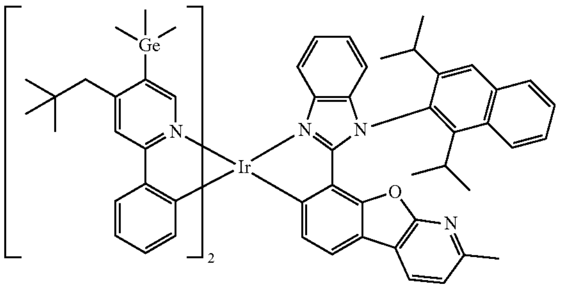
1701
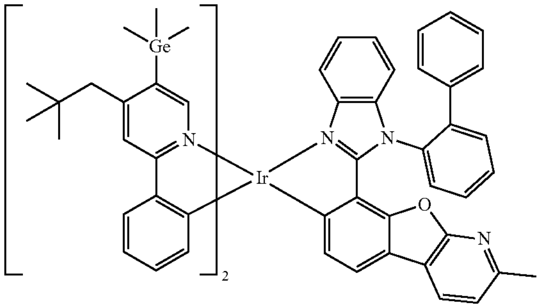
1702
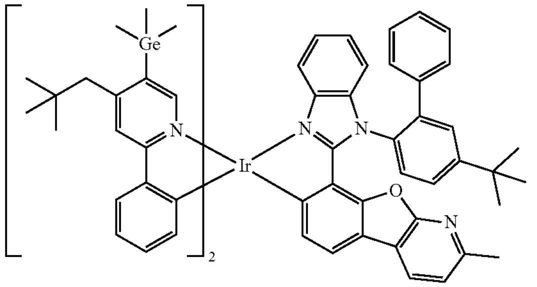
1703
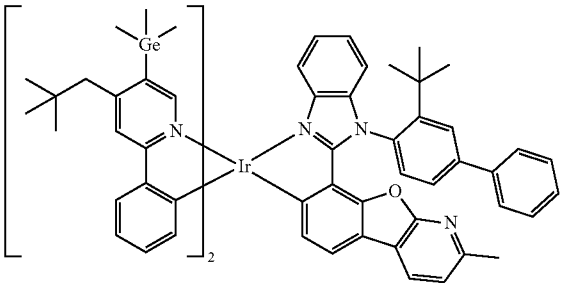
1704
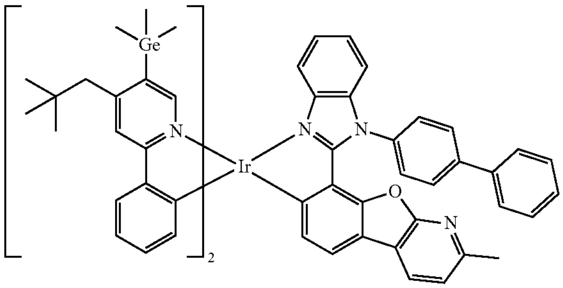
1705
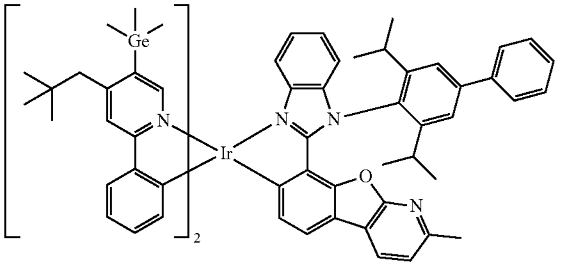
1706
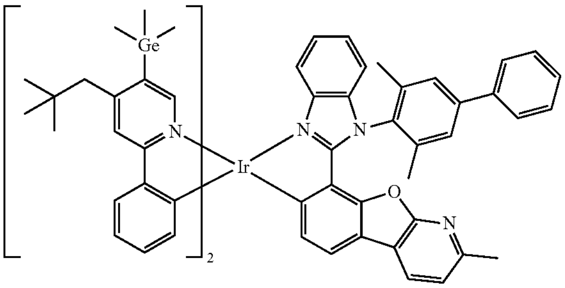
1707
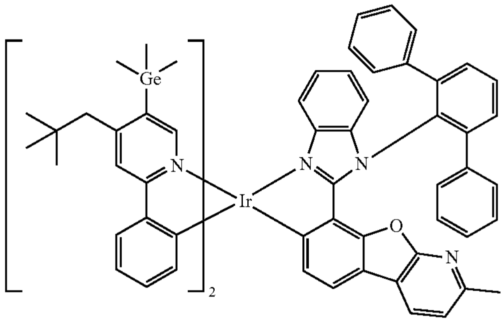
1708
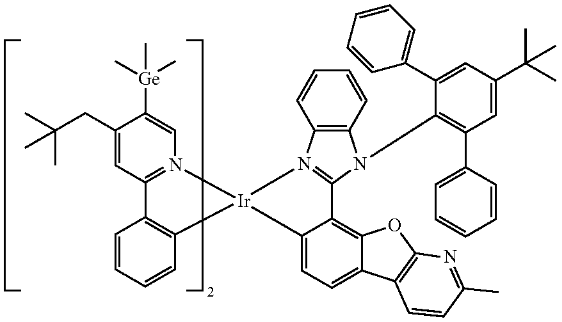
1709
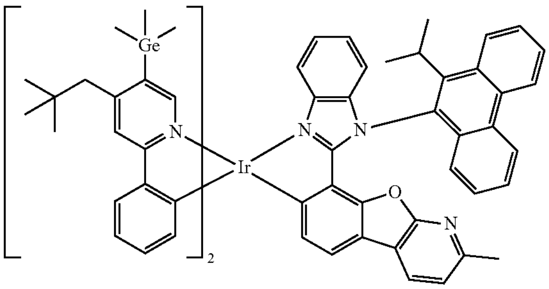

-continued
1710
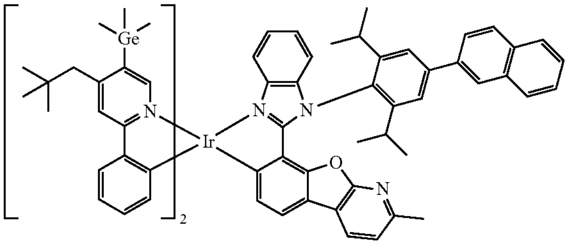
1711
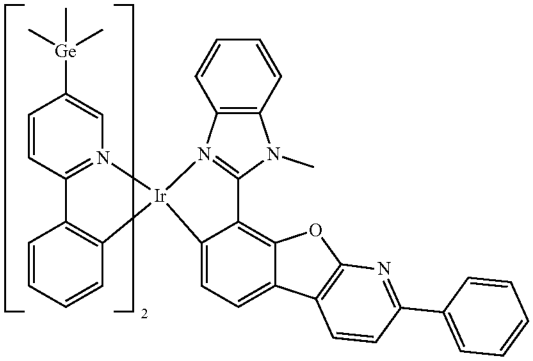
1712
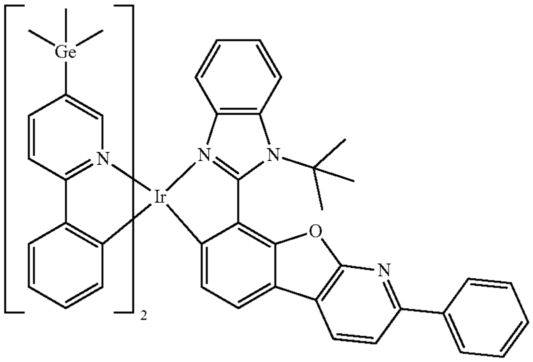
1713
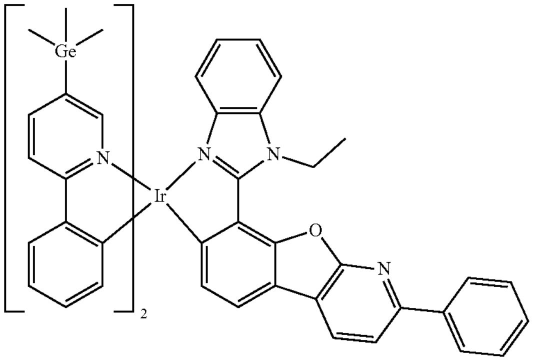
-continued
1714
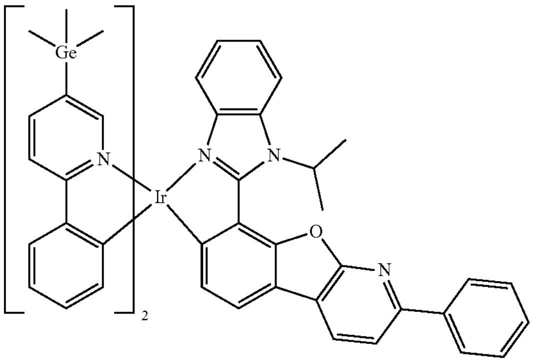
1715
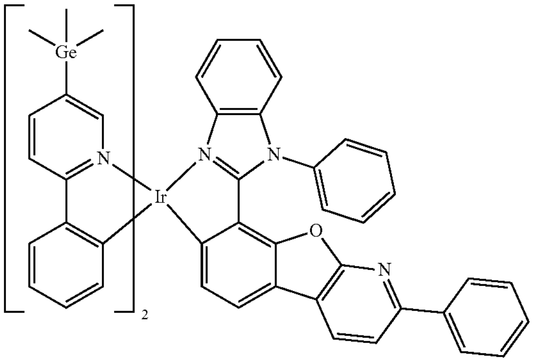
1716
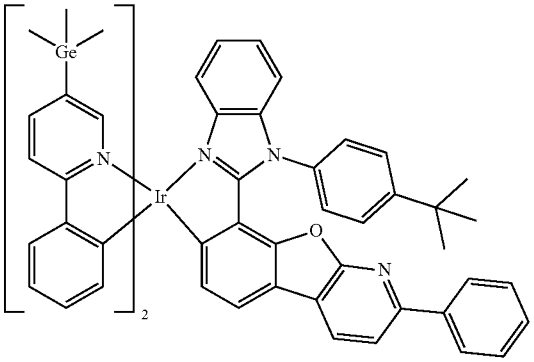
1717
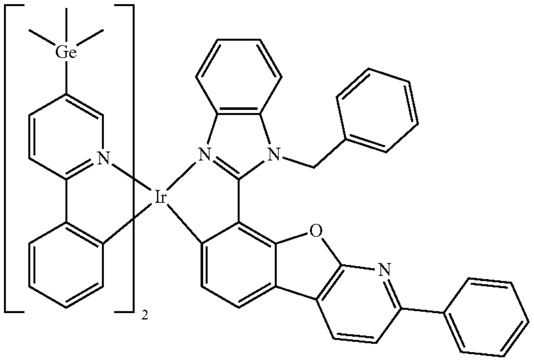

-continued
1718
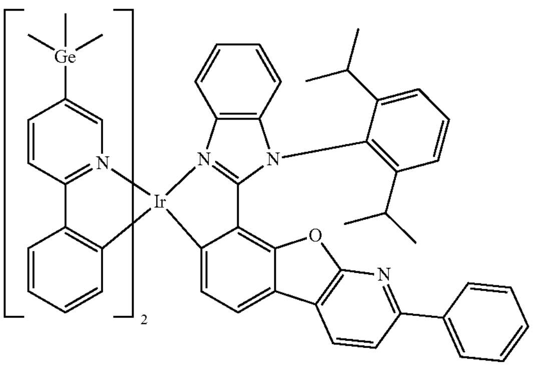
1719
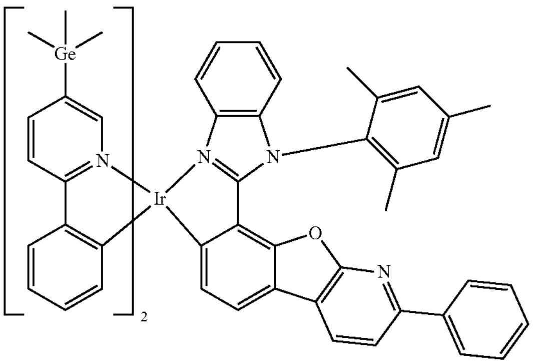
1720
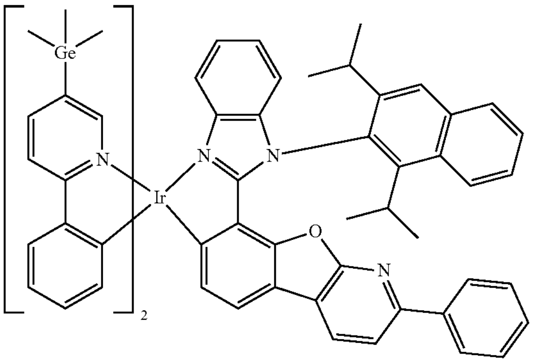
1721
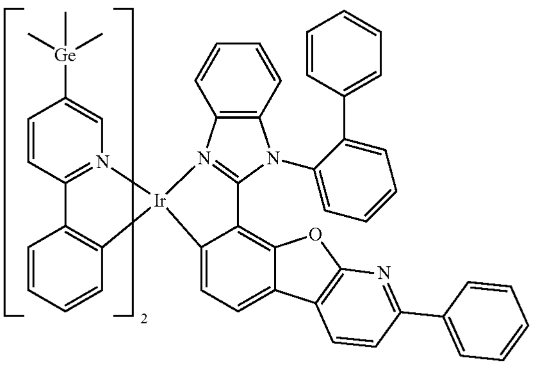
-continued
1722
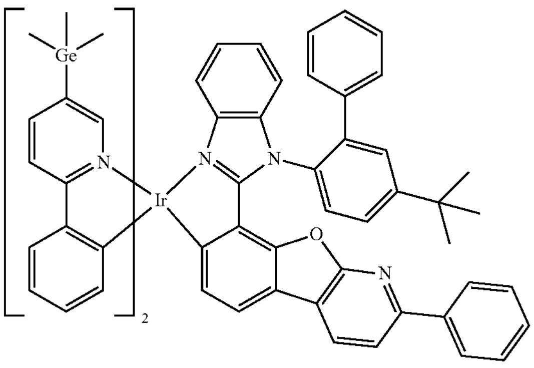
1723
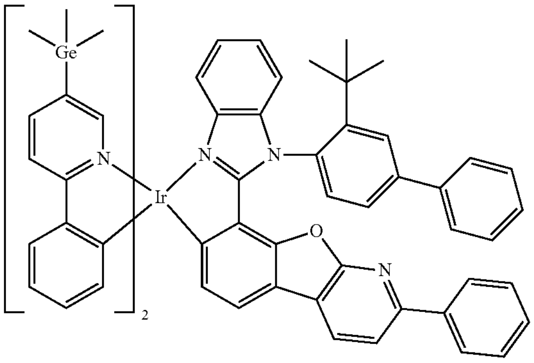
1724
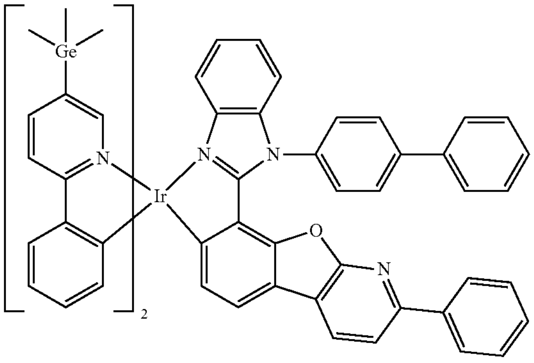
1725
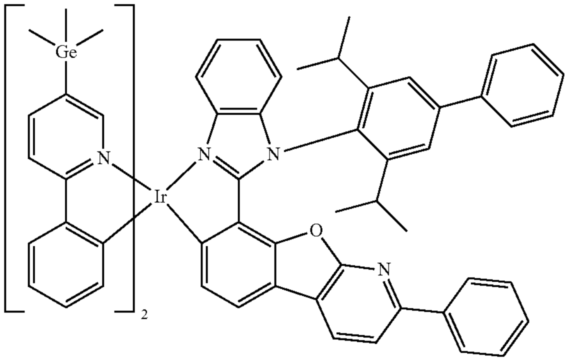

-continued
1726
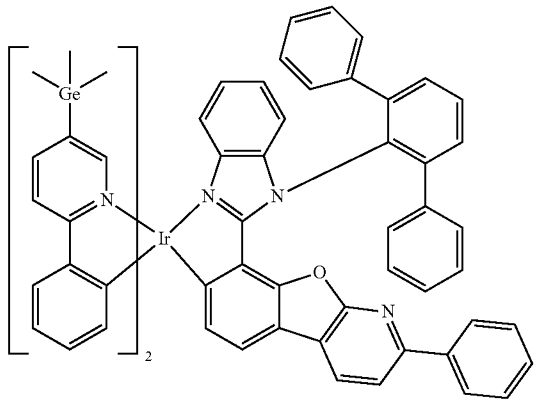
1727
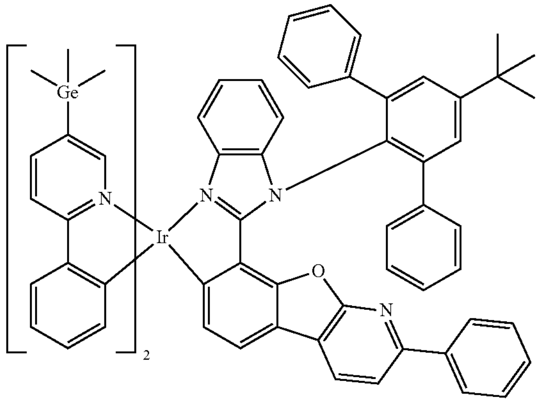
1728
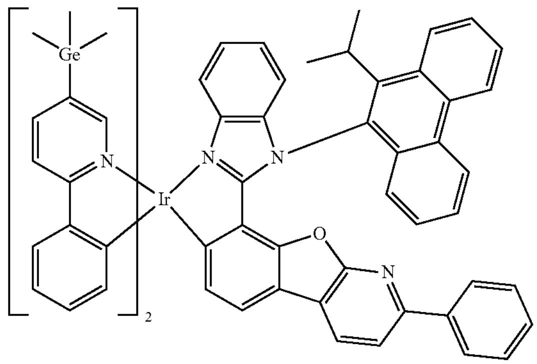
1729
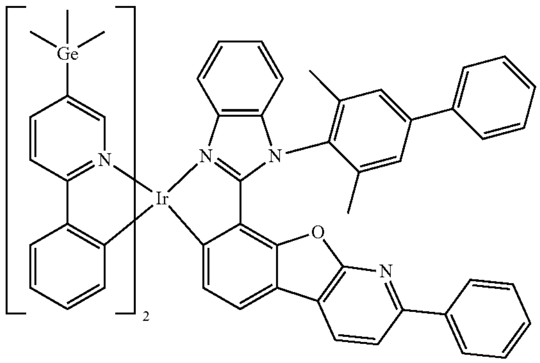
1730
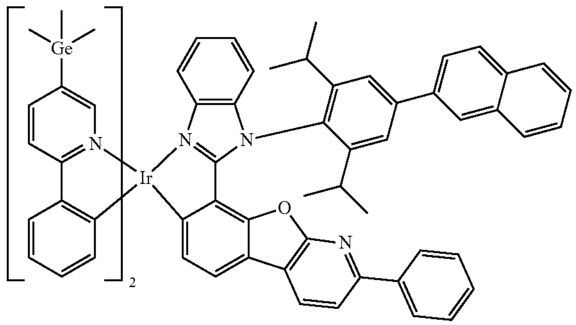
1731
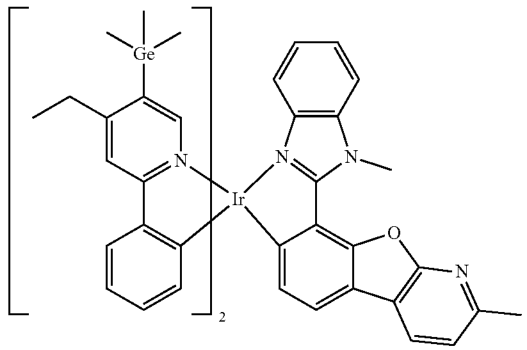
1732
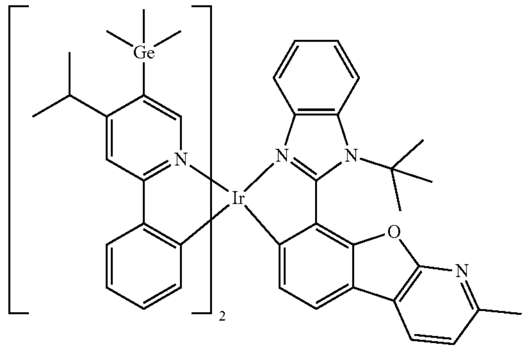
1733
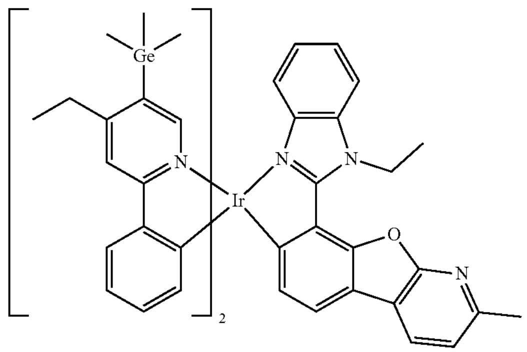

-continued
1734
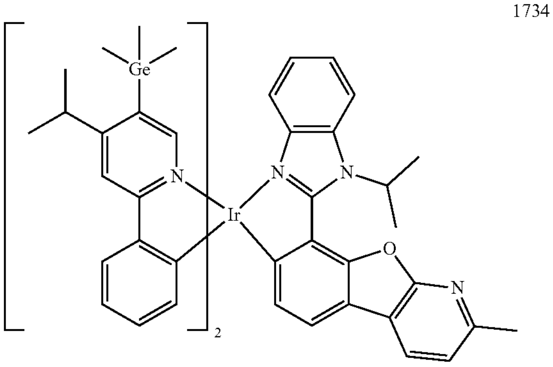
1735
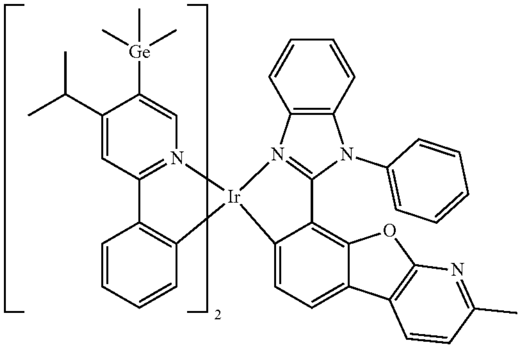
1736
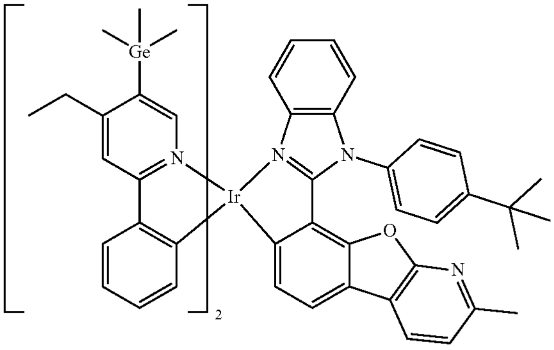
1737
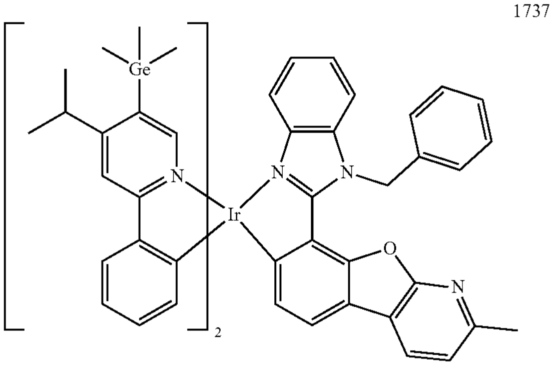
-continued
1738
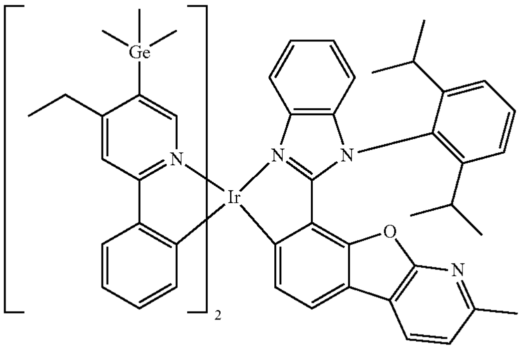
1739
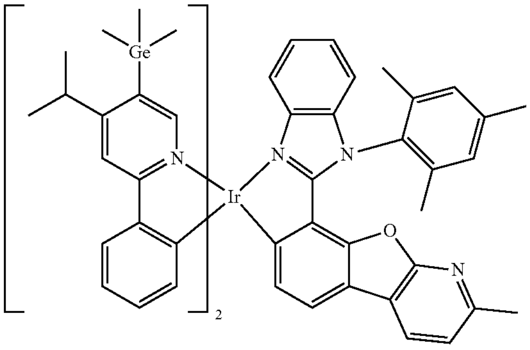
1740
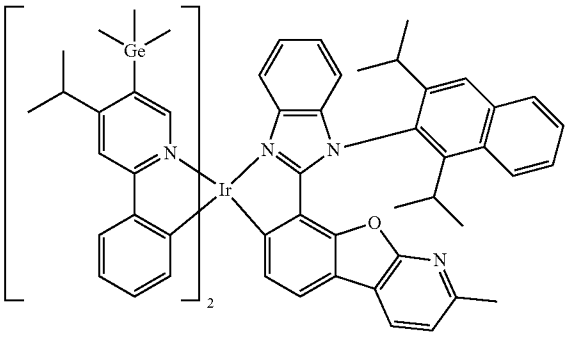
1741
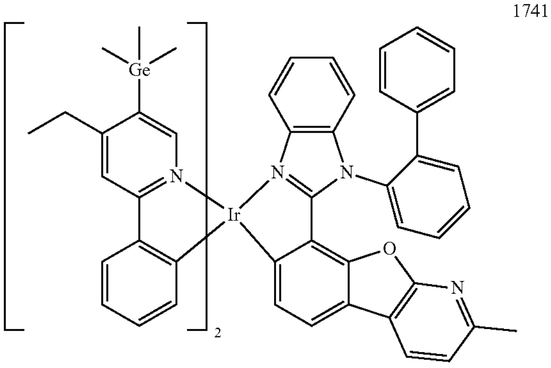

-continued
1742
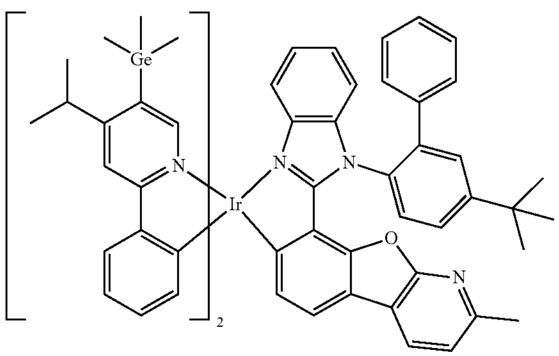
1743
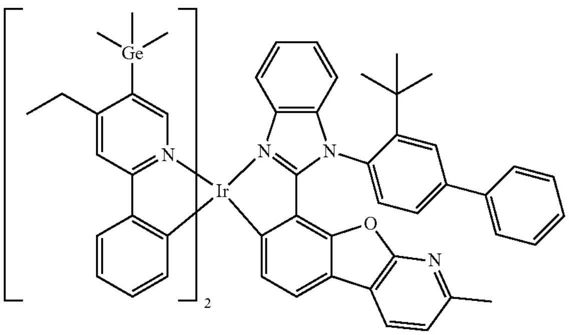
1744
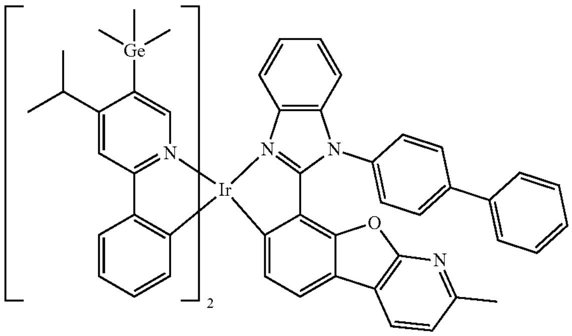
1745
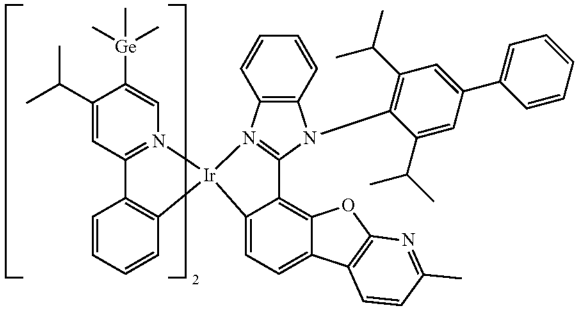
-continued
1746
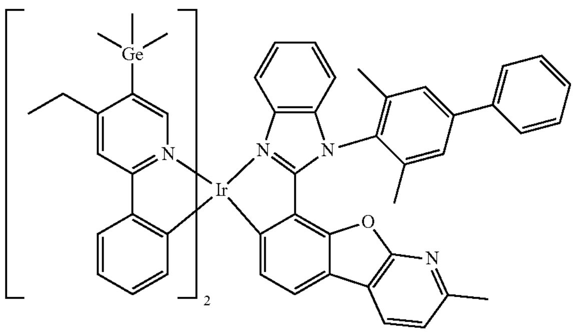
1747
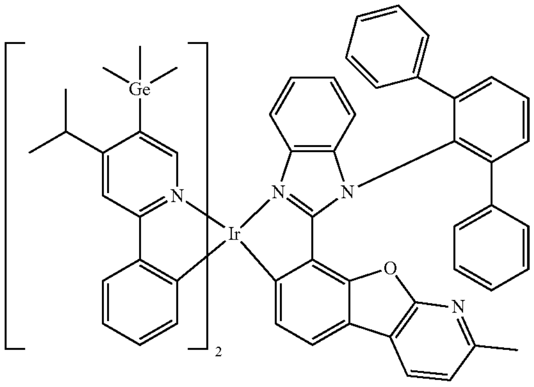
1748
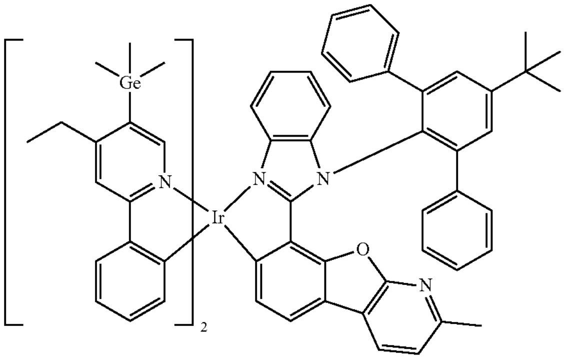
1749
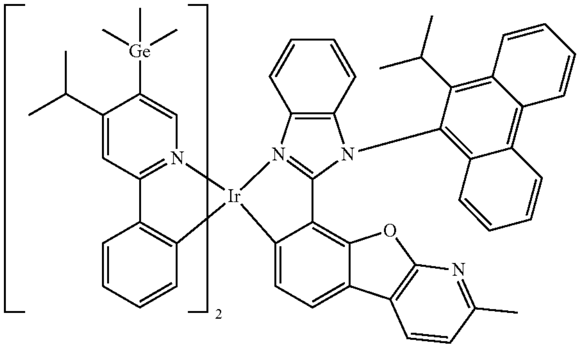

-continued
1750
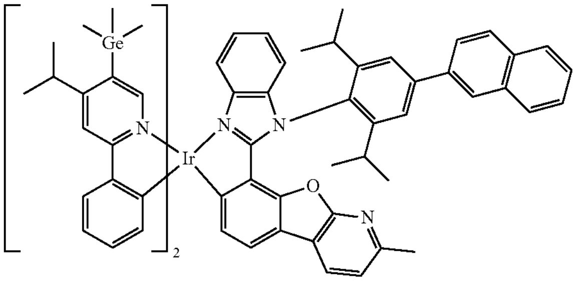
1751
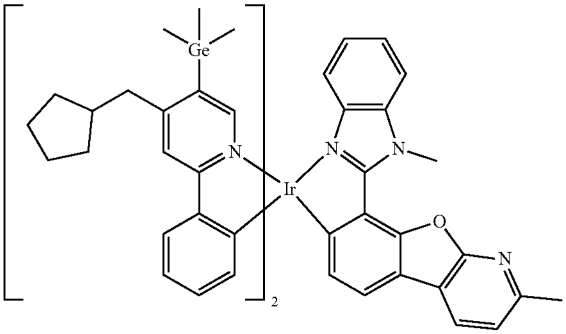
1752
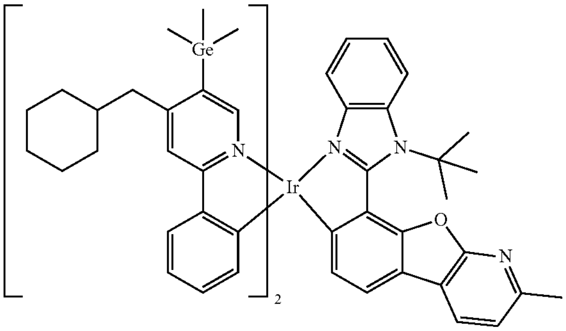
1753
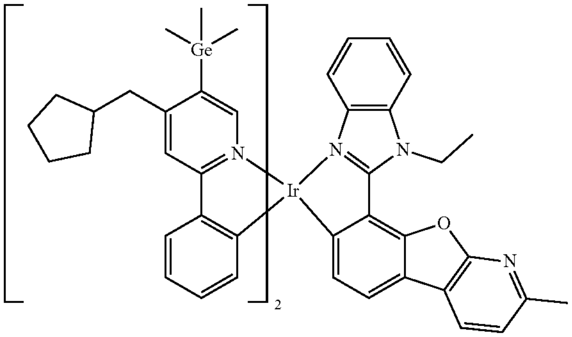
-continued
1754
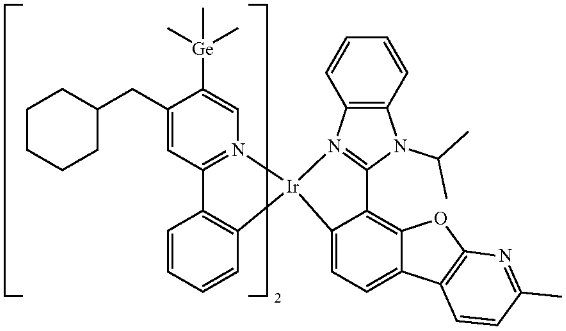
1755
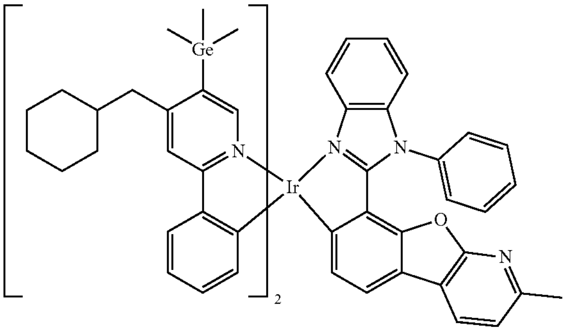
1756
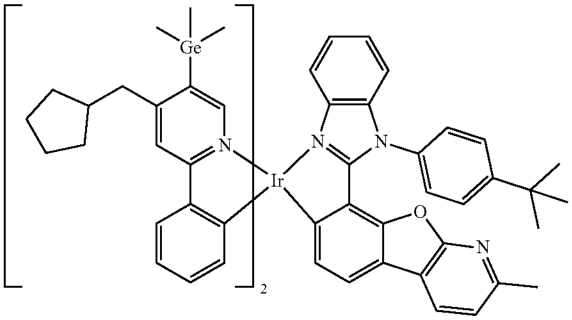
1757
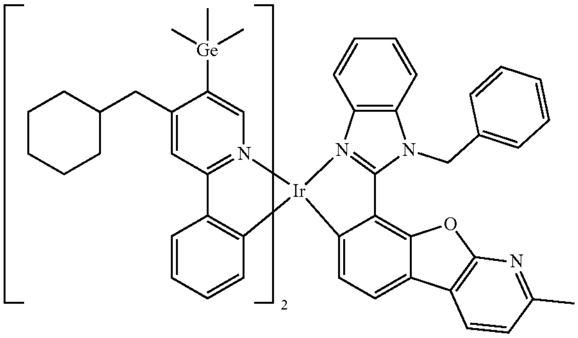

-continued
1758
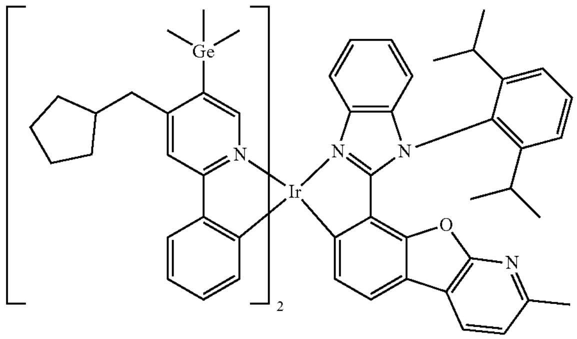
1759
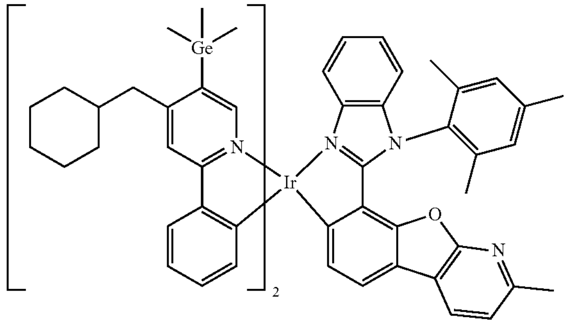
1760
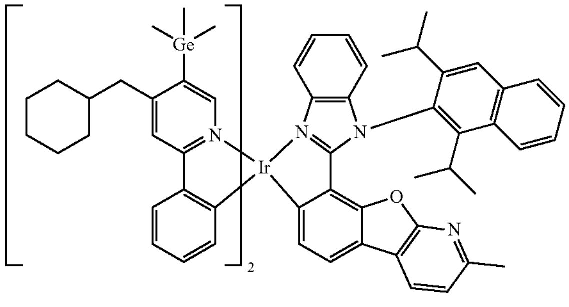
1761
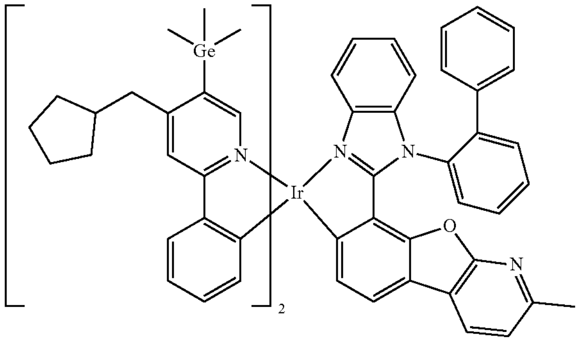
-continued
1762
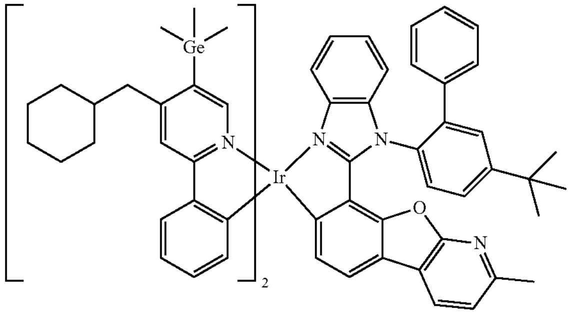
1763
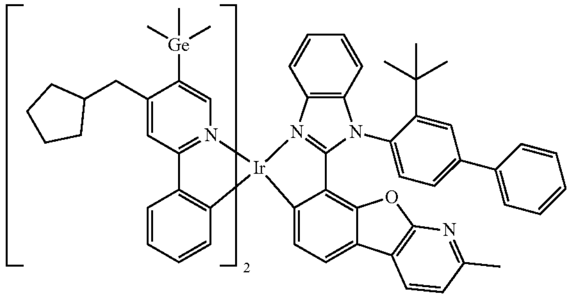
1764
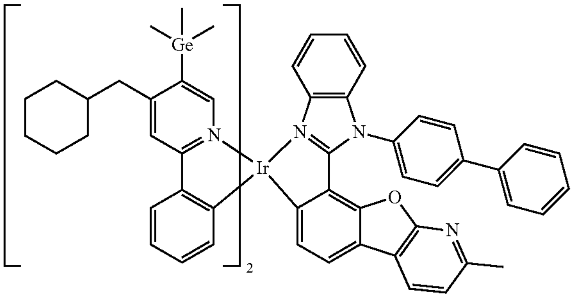
1765
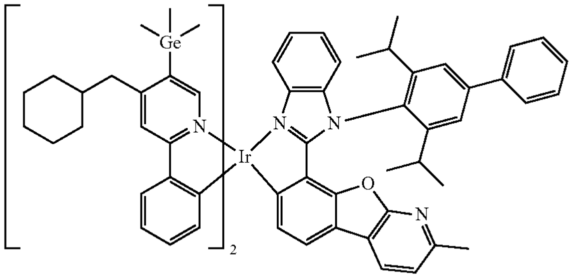
1766
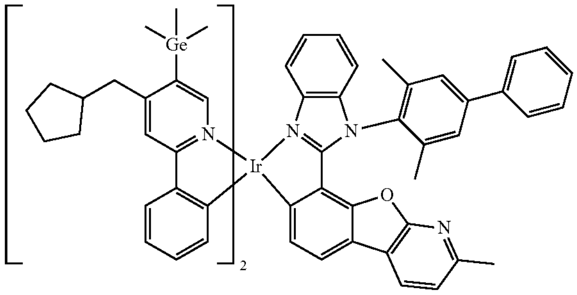

-continued
1767
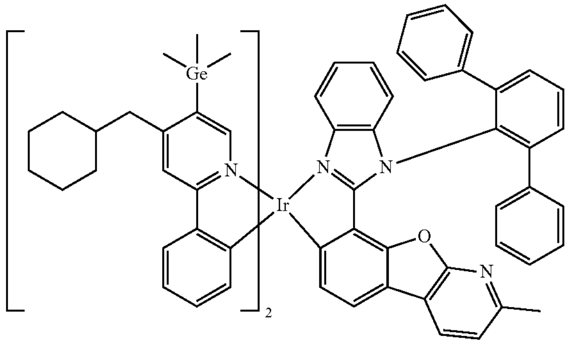
1768
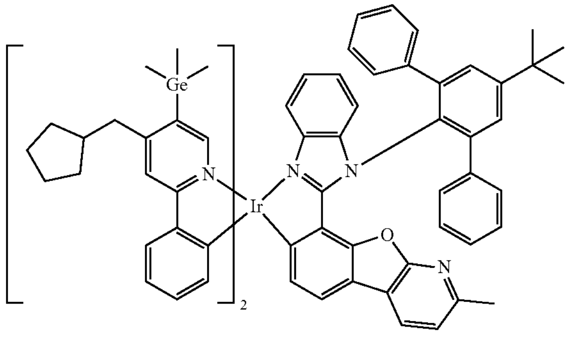
1769
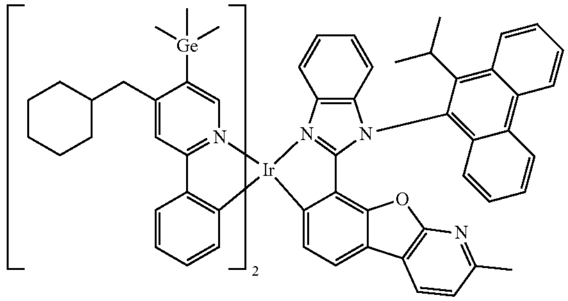
1770
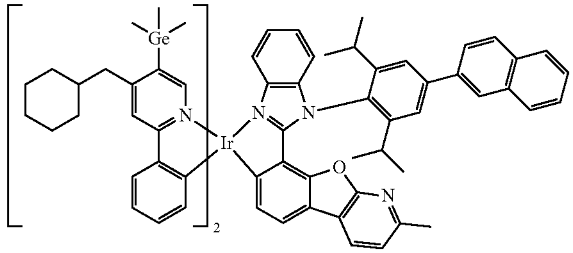
-continued
1771
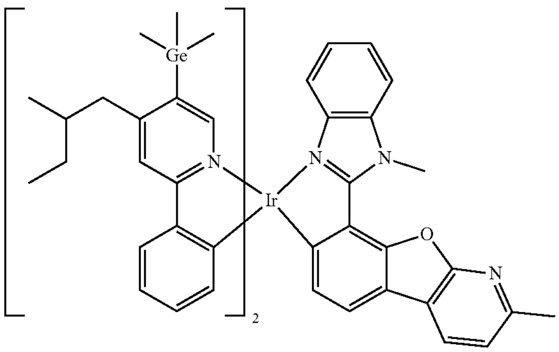
1772
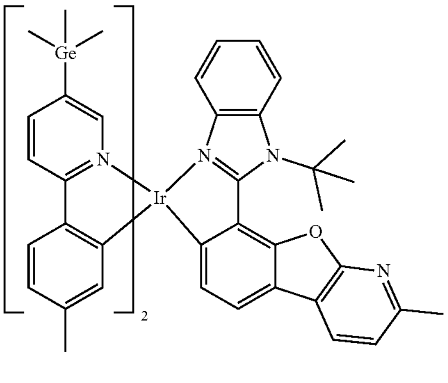
1773
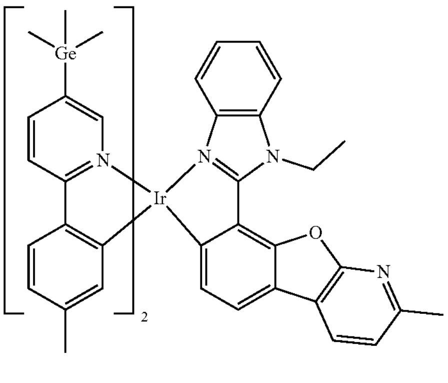
1774
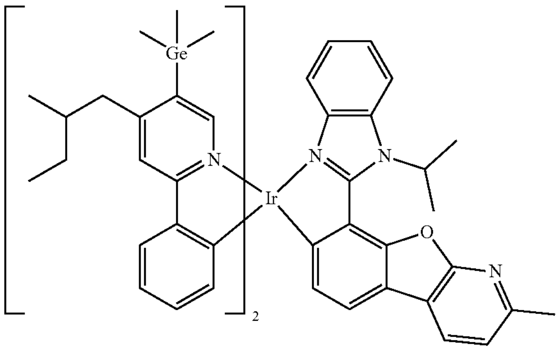

-continued
1775
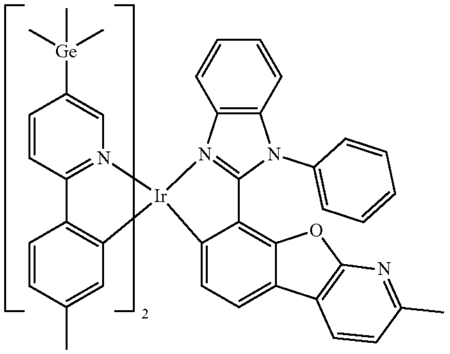
1776
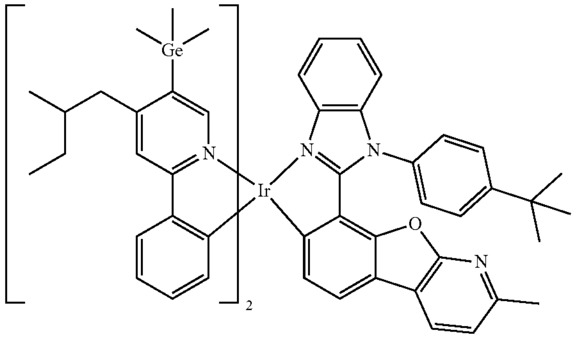
1777
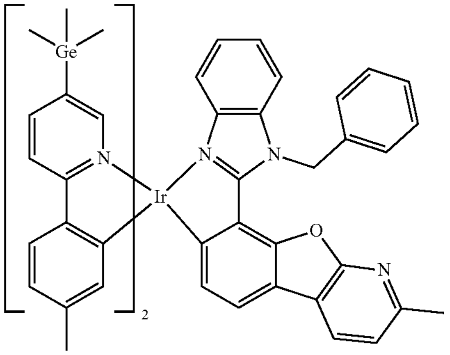
1778
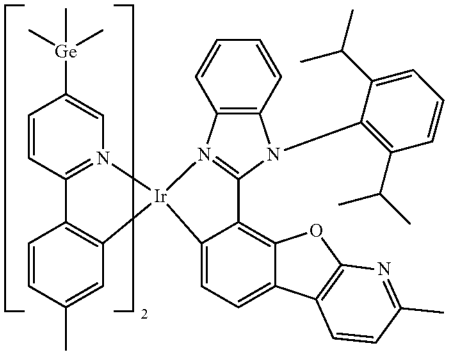
-continued
1779
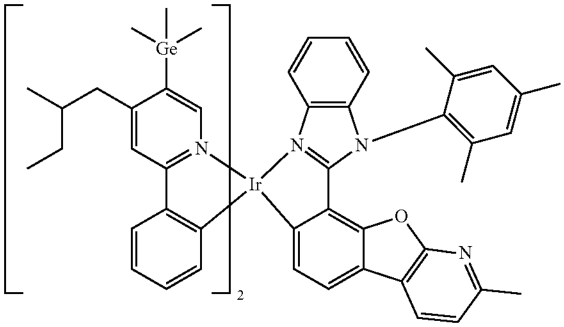
1780
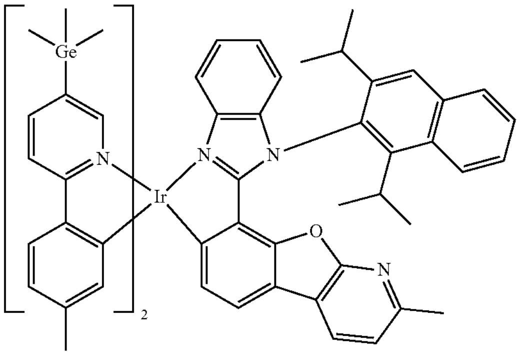
1781
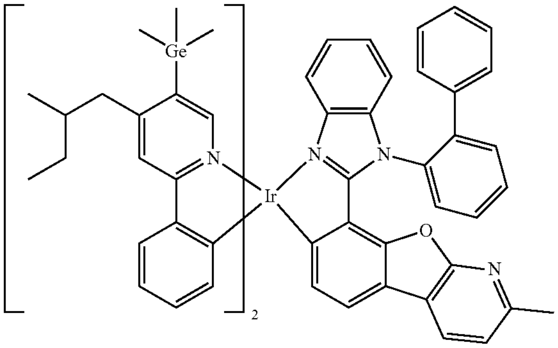
1782
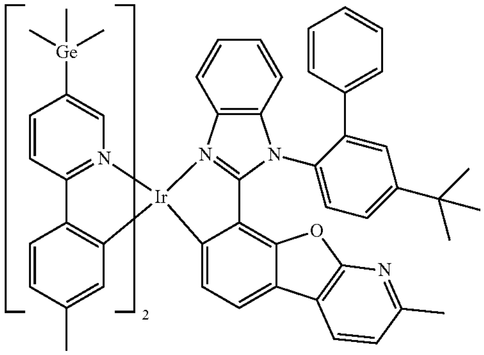

-continued
1783
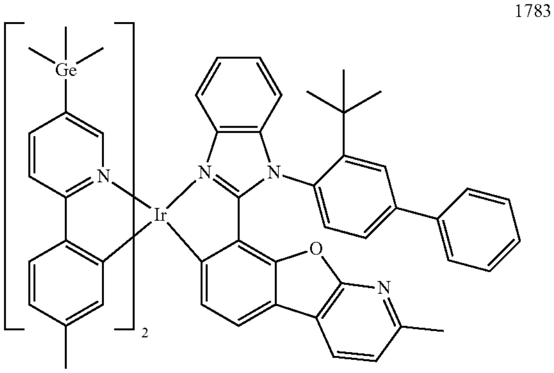
1784
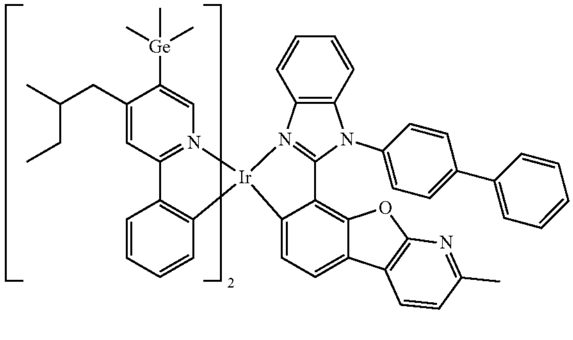
1785
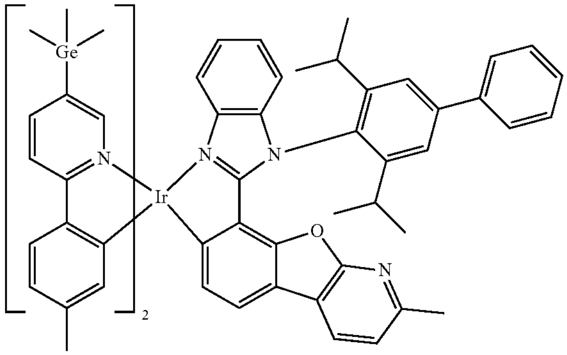
1786
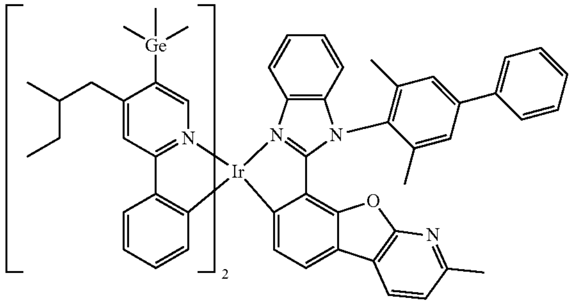
-continued
1787
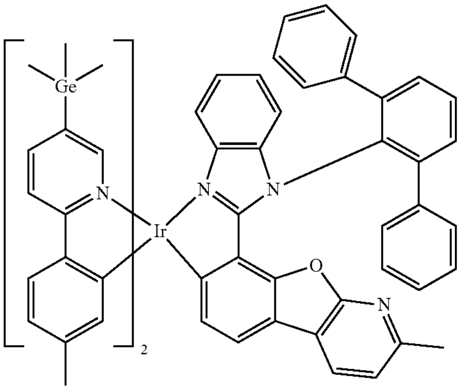
1788
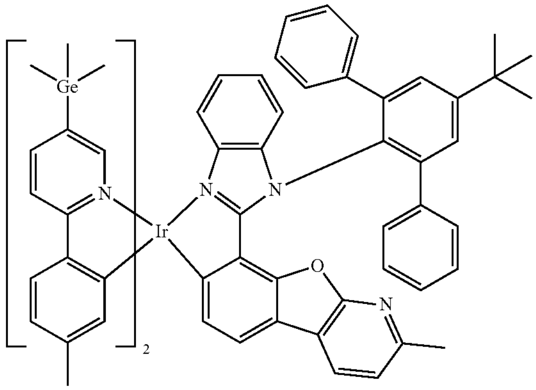
1789
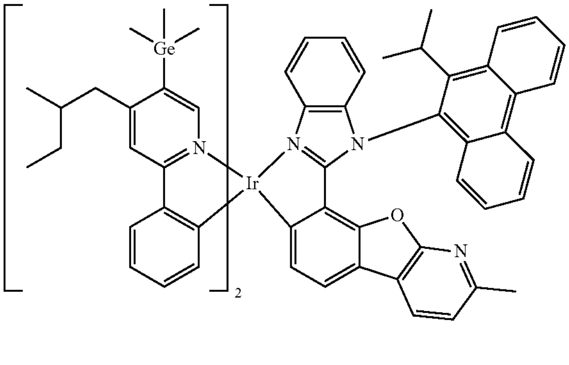
1790
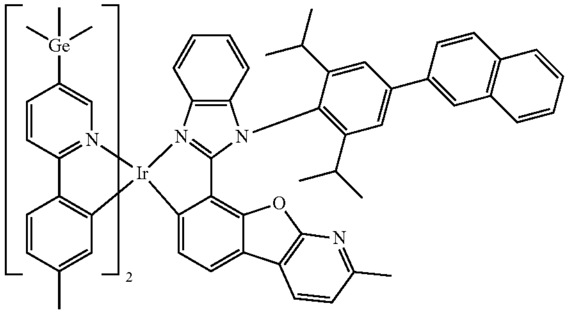

-continued
1791
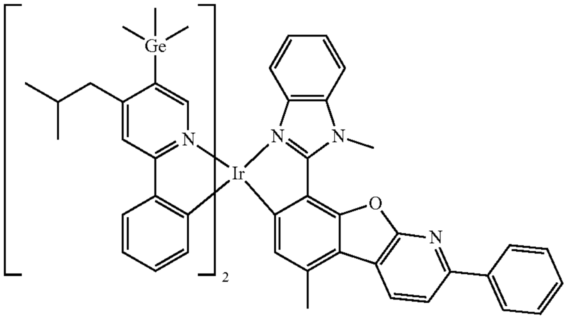
1792
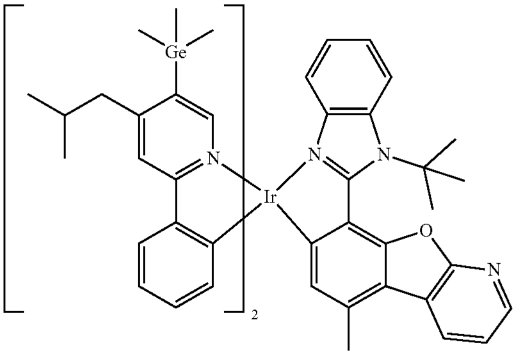
1793
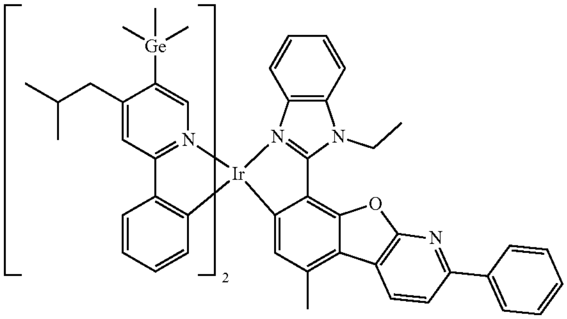
1794
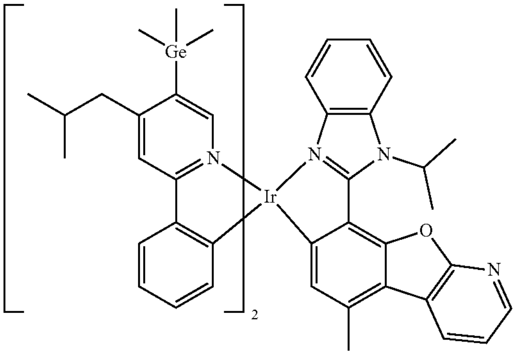
-continued
1795
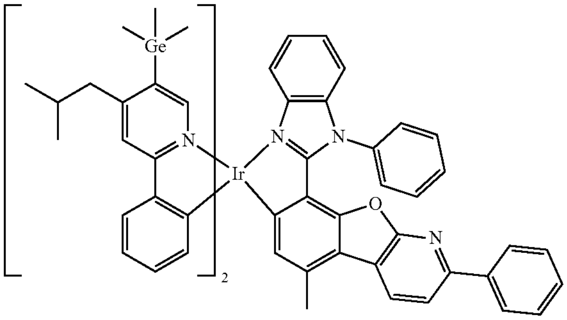
1796
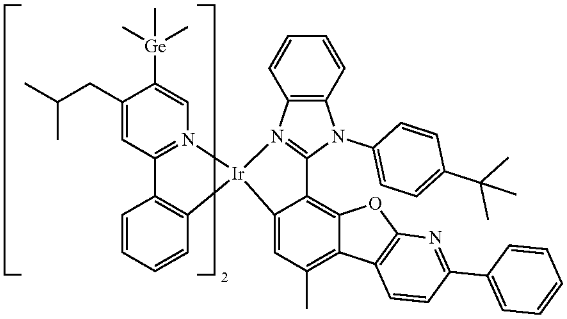
1797
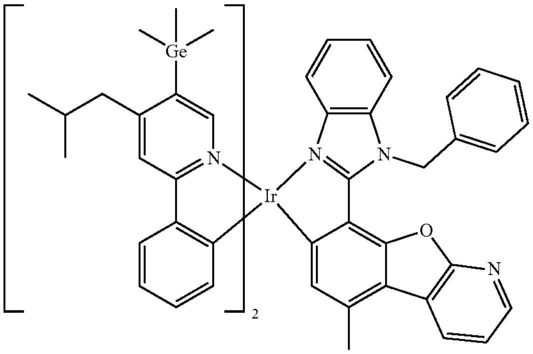
1798
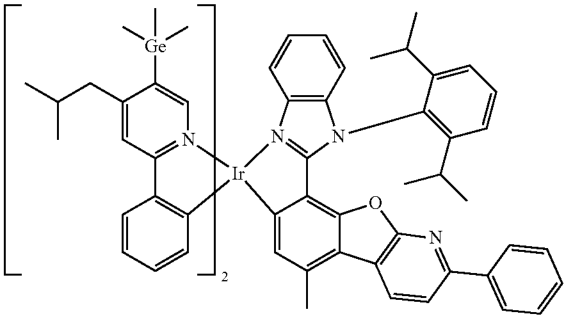

-continued
1799
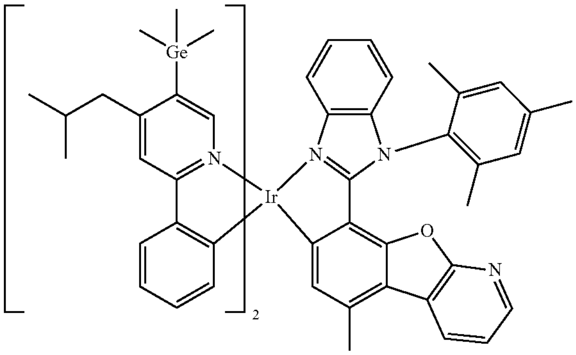
1800
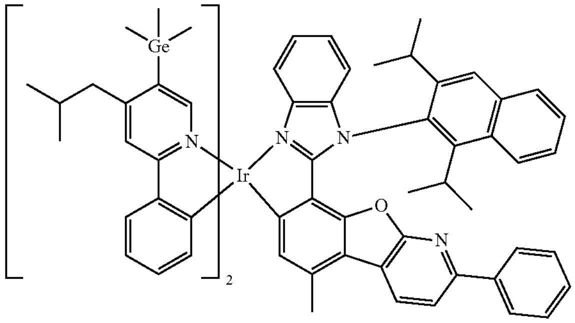
1801
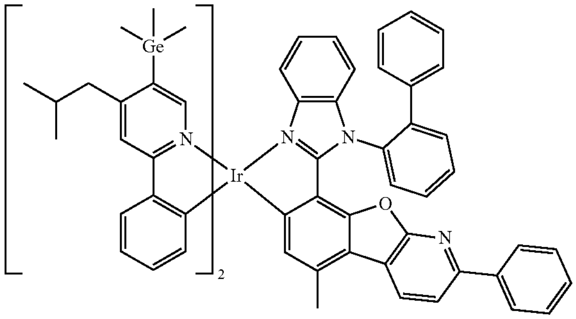
1802
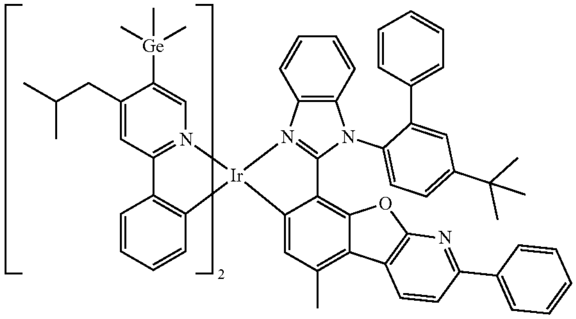
-continued
1803
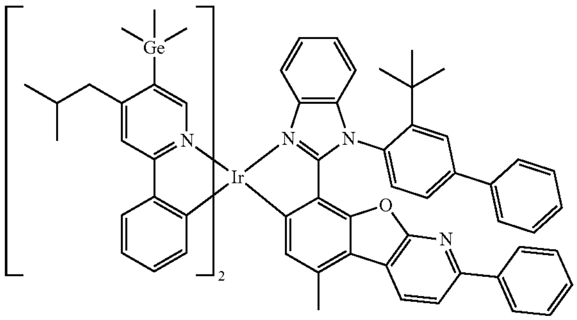
1804
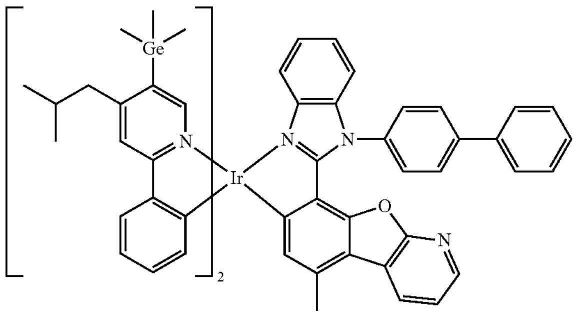
1805
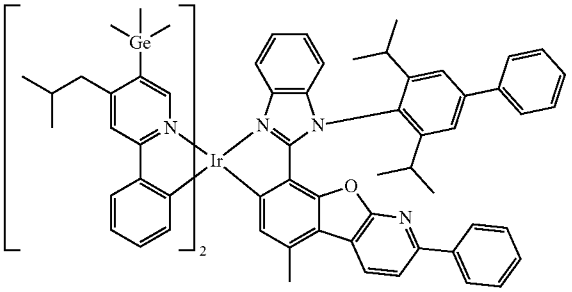
1806
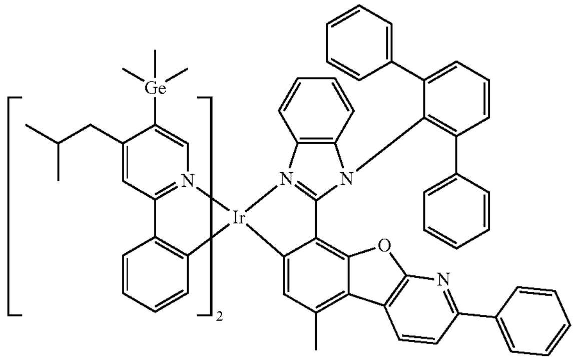

-continued
1807
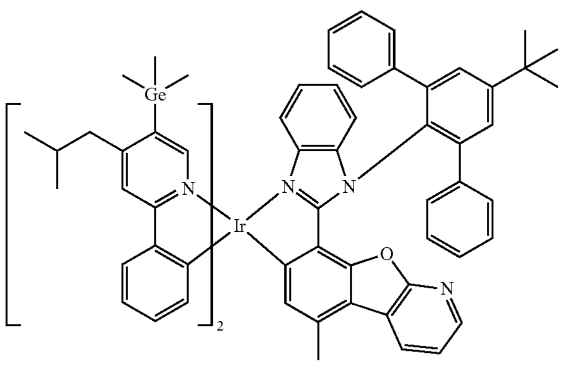
1808
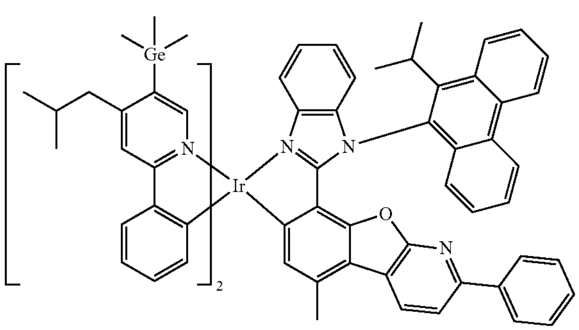
1809
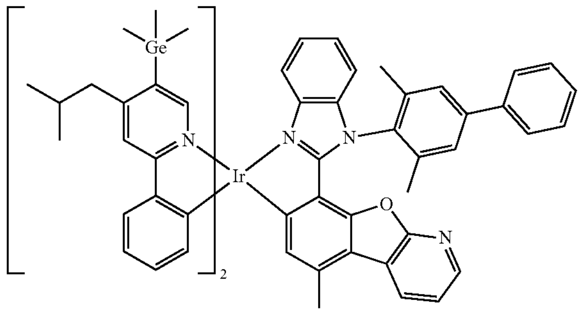
1810
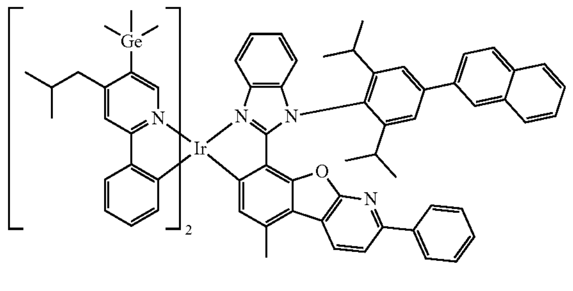
-continued
1811
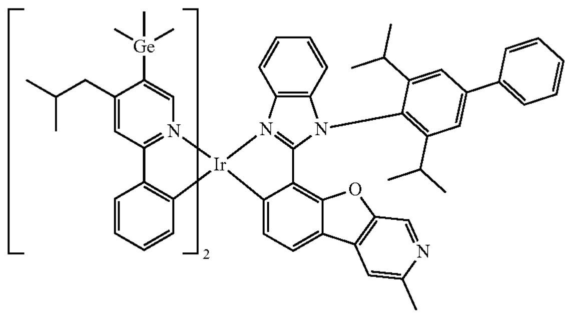
1812
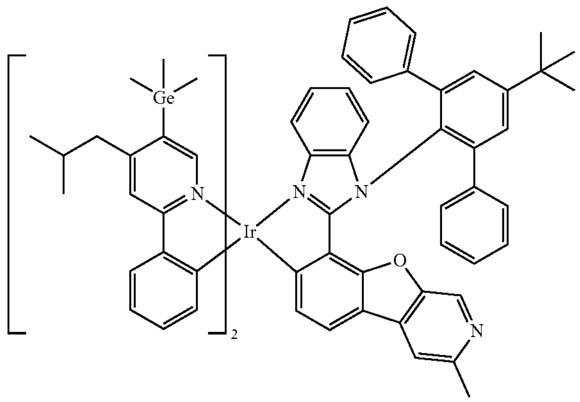
1813
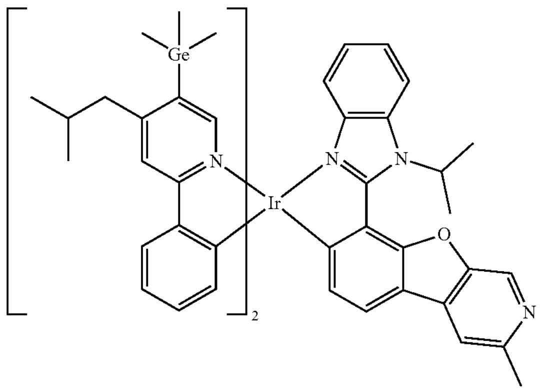
1814
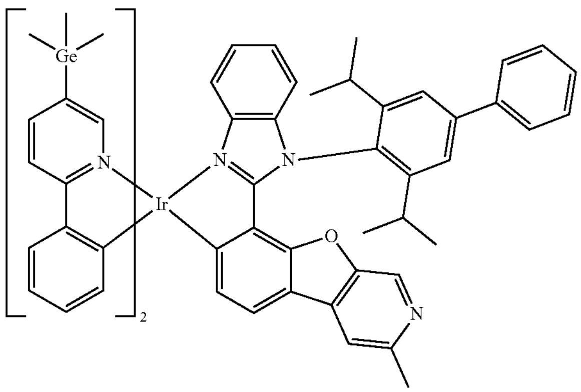

-continued
1815
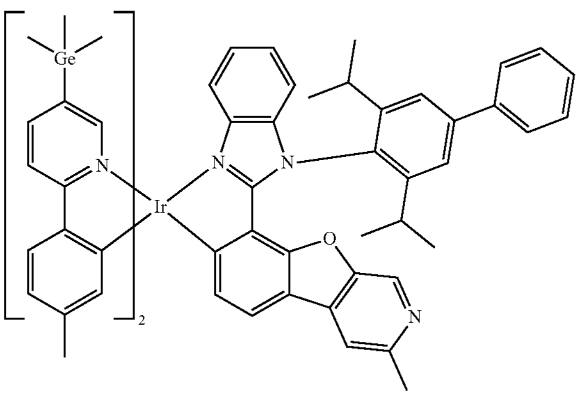
1816
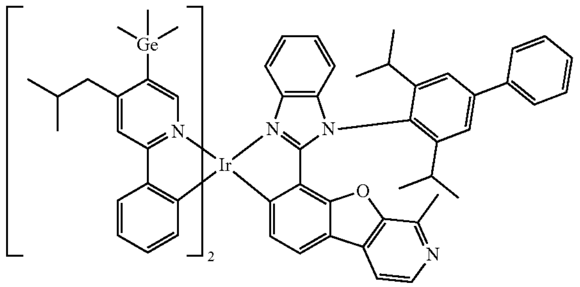
1817
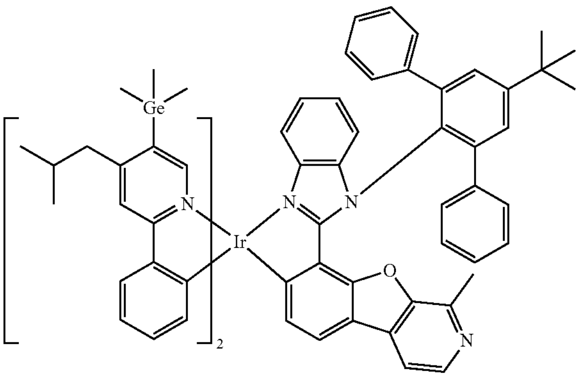
1818
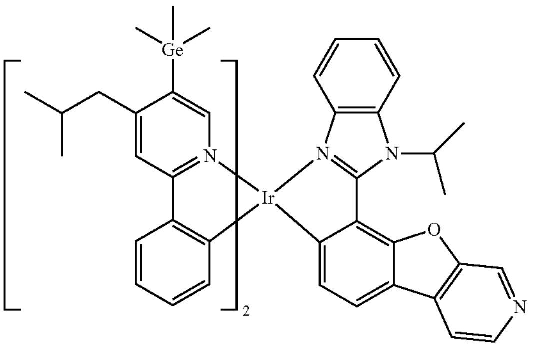
-continued
1819
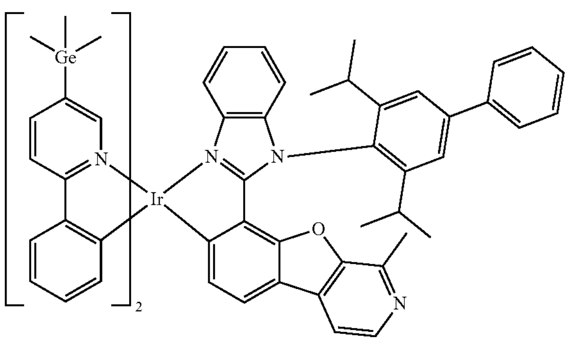
1820
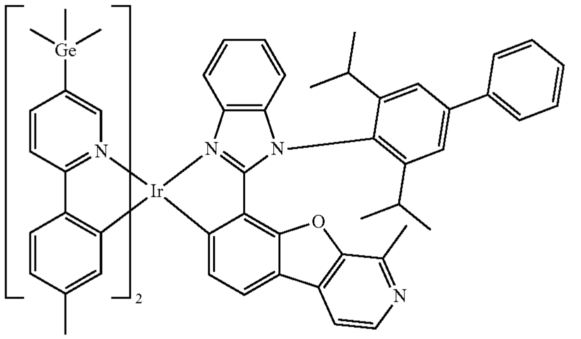
1821
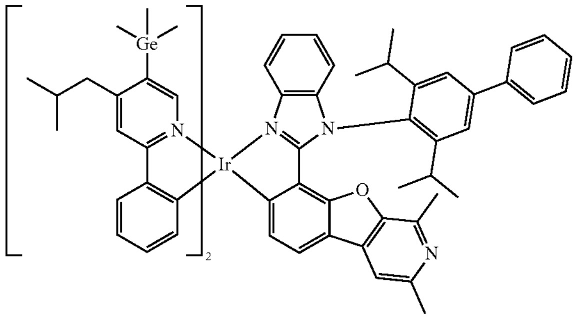
1822
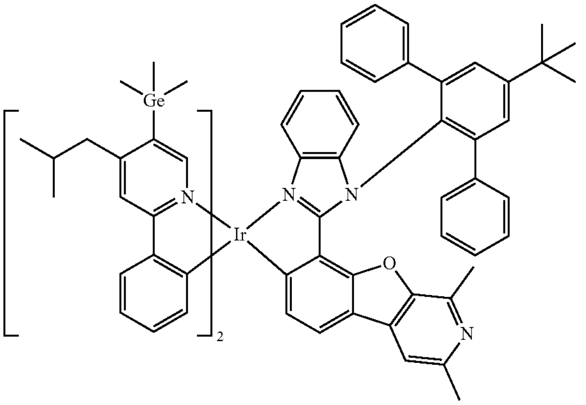

-continued
1823
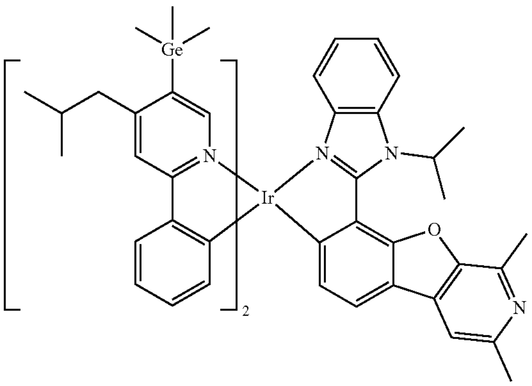
1824
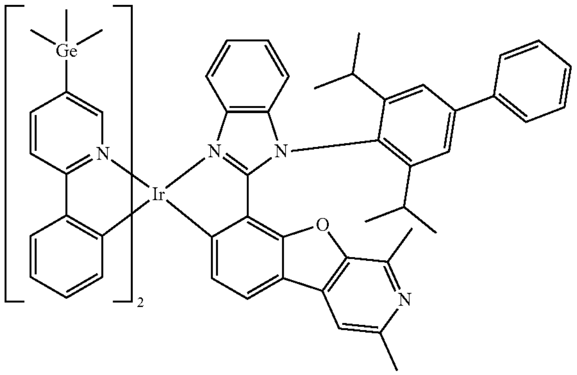
1825
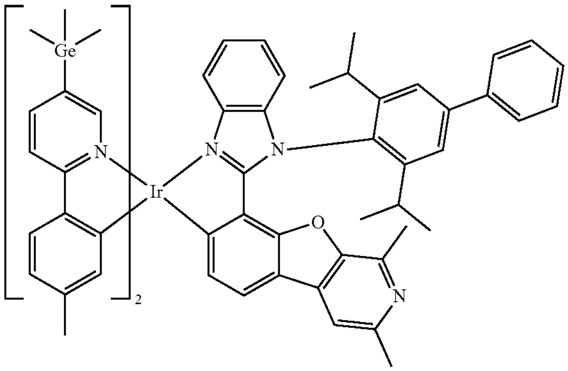
1826
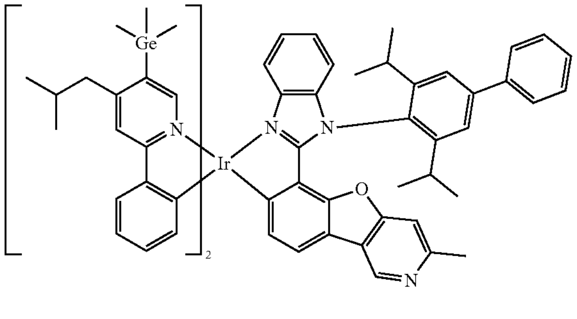
-continued
1827
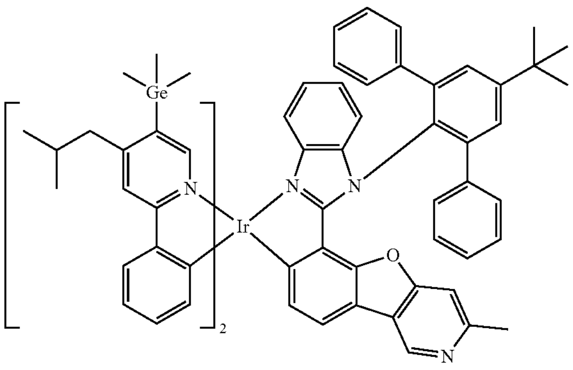
1828
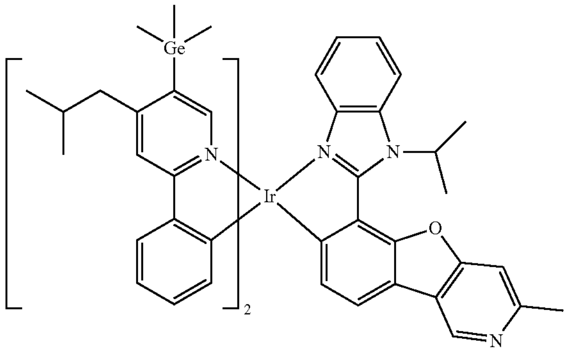
1829
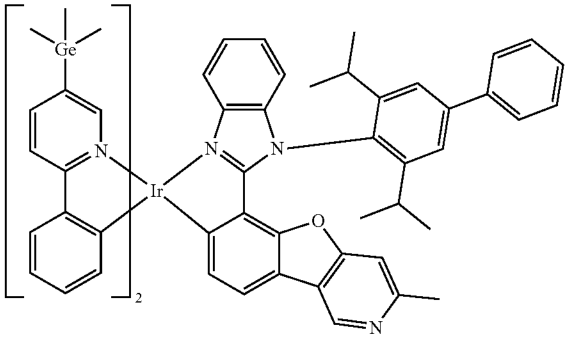
1830
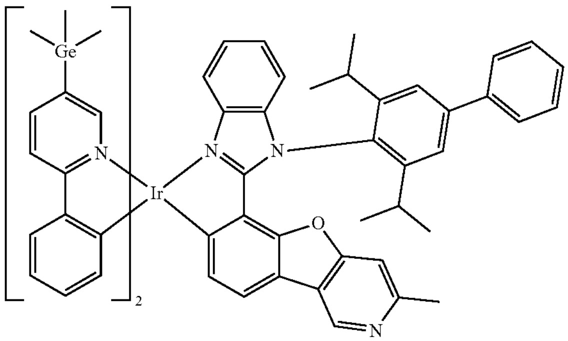

-continued
1831
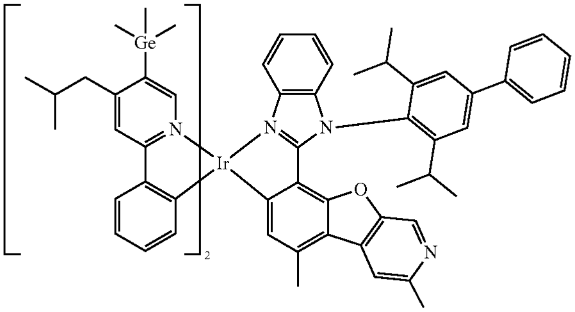
1832
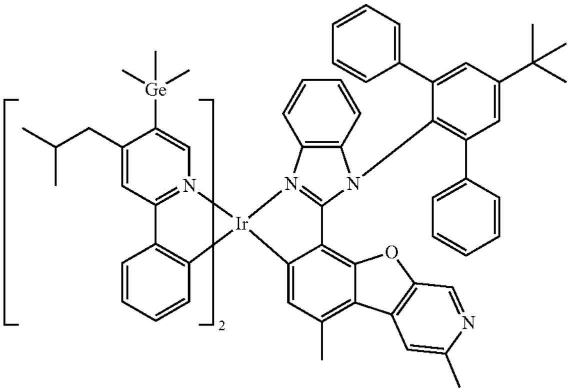
1833
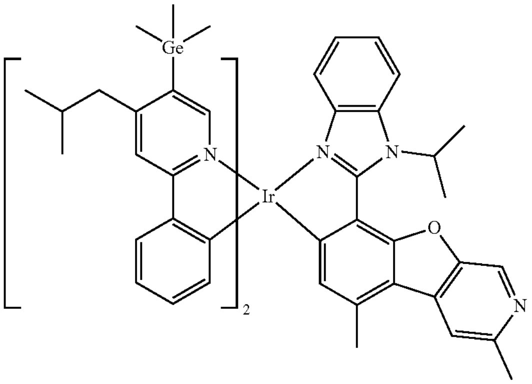
1834
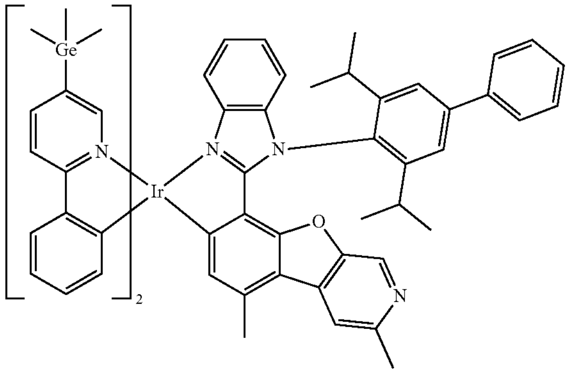
-continued
1835
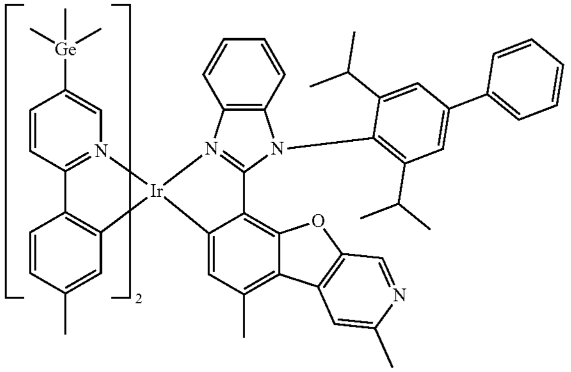
1836
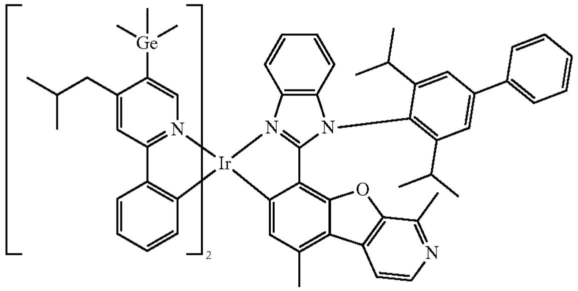
1837
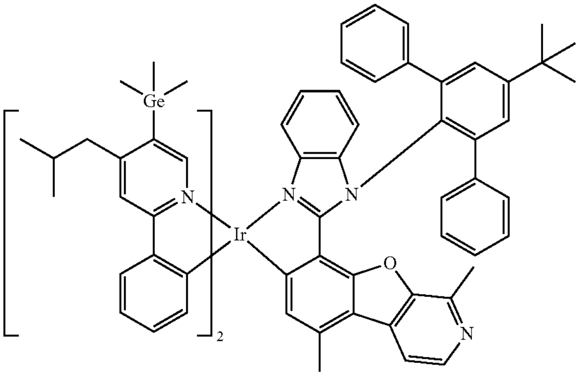
1838
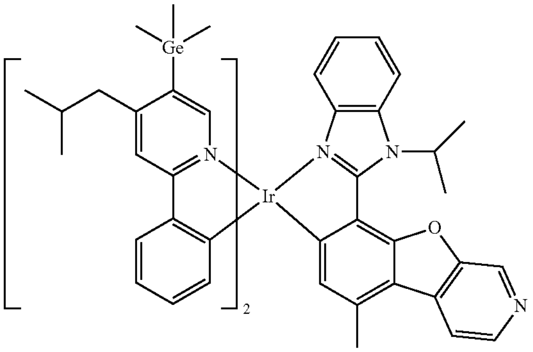

-continued
1839
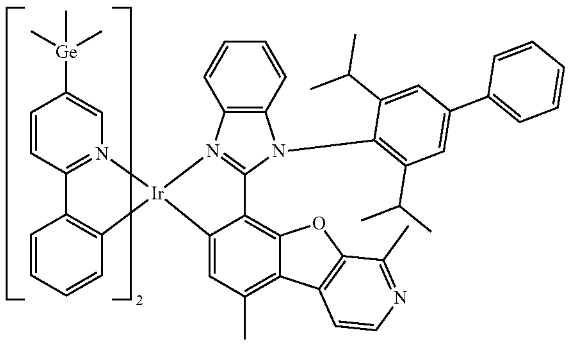
1840
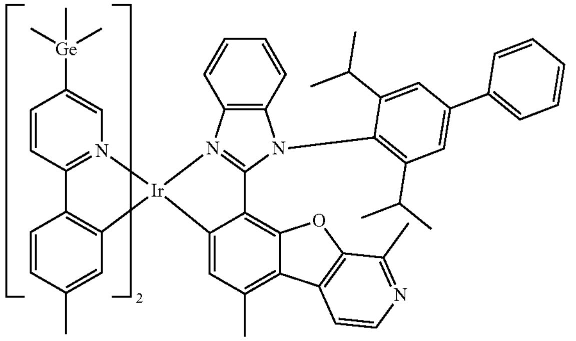
1841
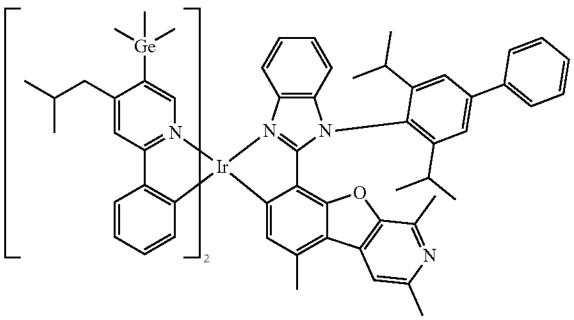
1842
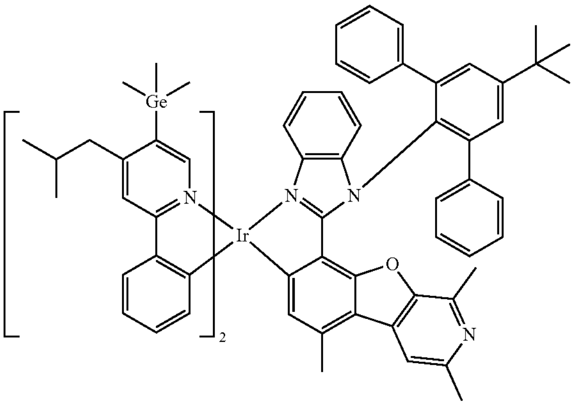
-continued
1843
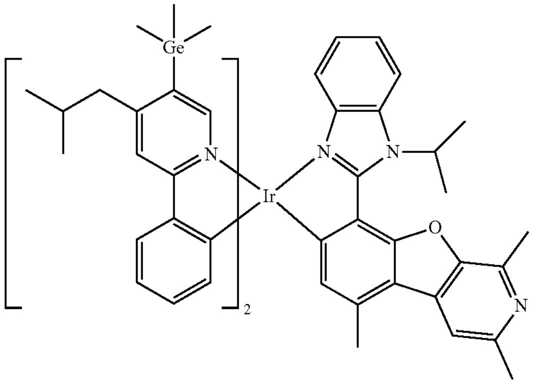
1844
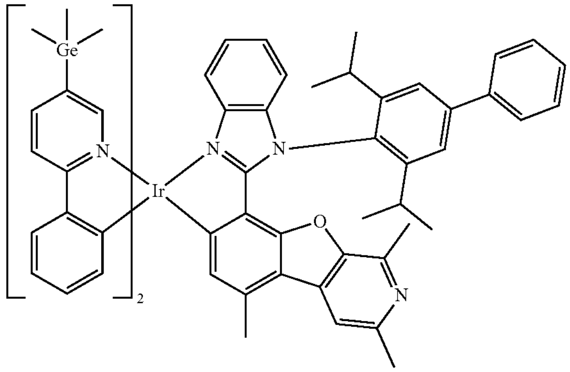
1845
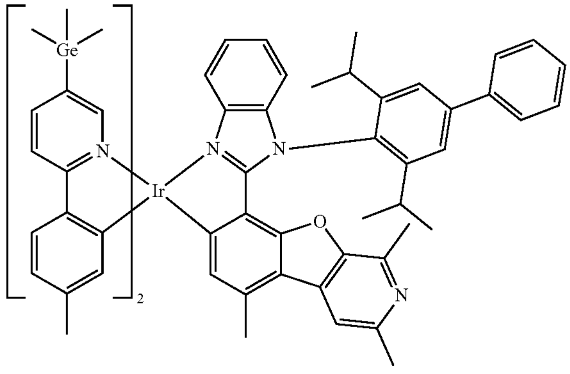
1846
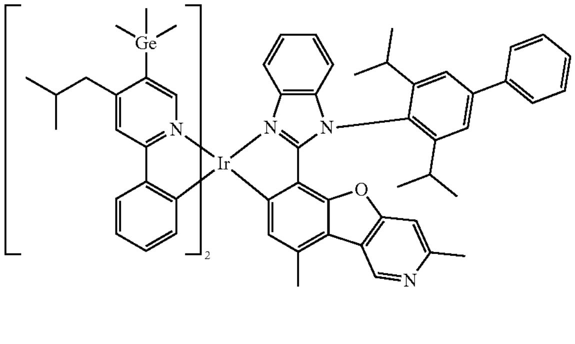

-continued
1847
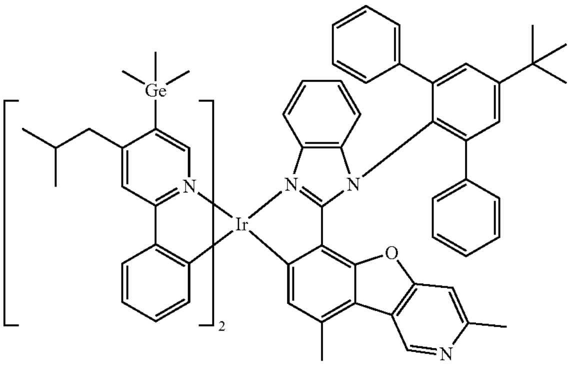
1848
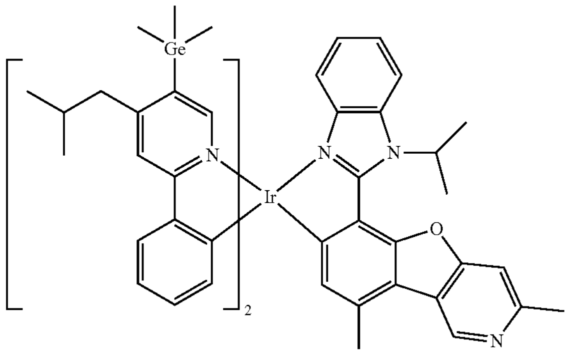
1849
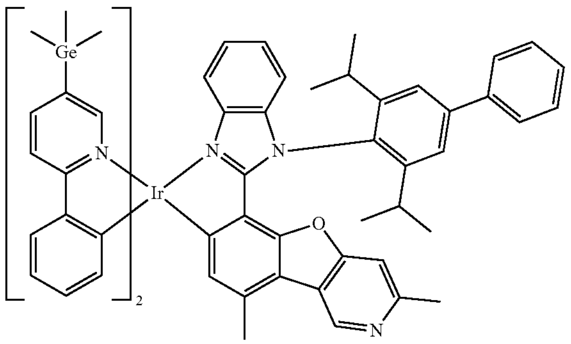
1850
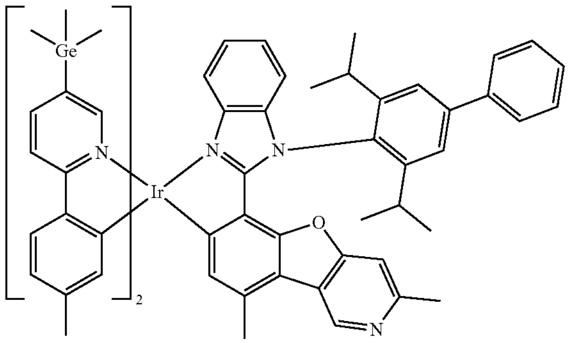
-continued
1851
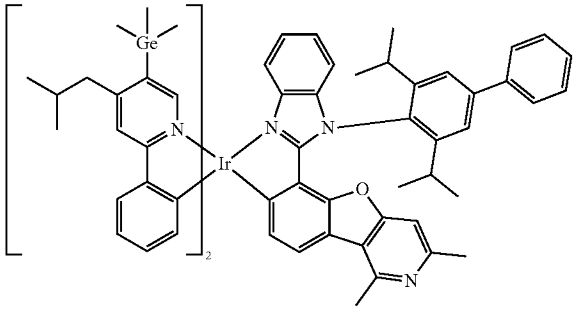
1852
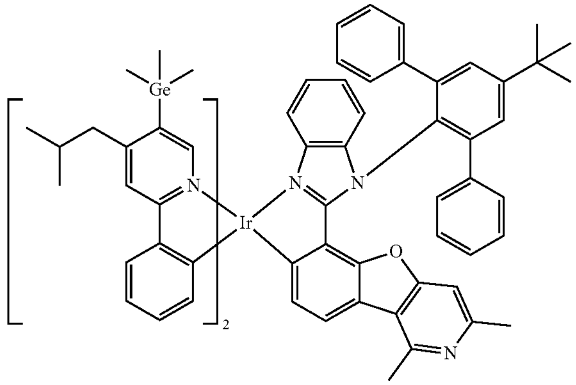
1853
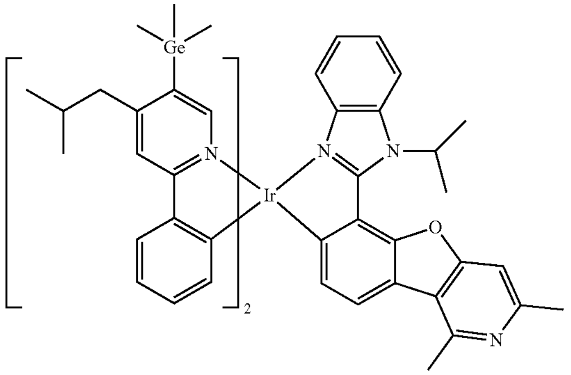
1854
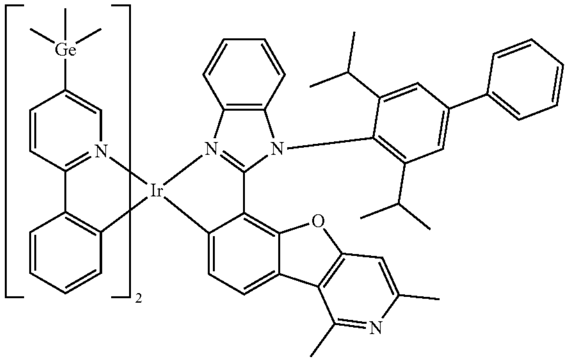

-continued
1855
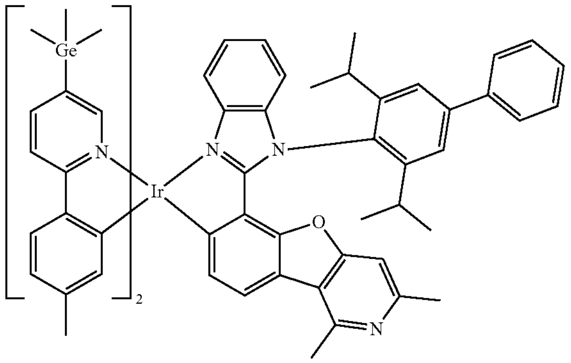
1856
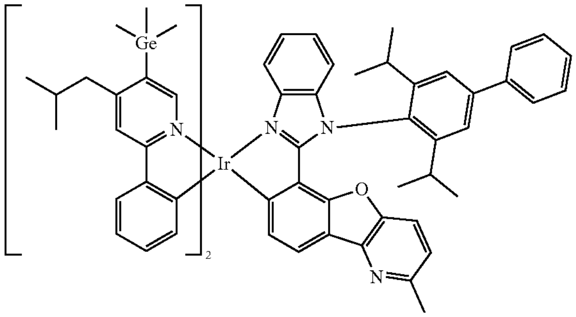
1857
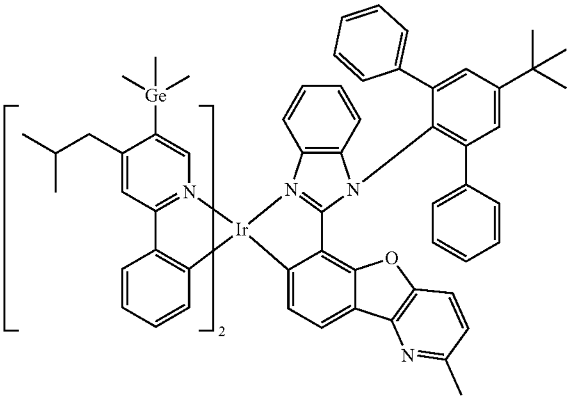
1858
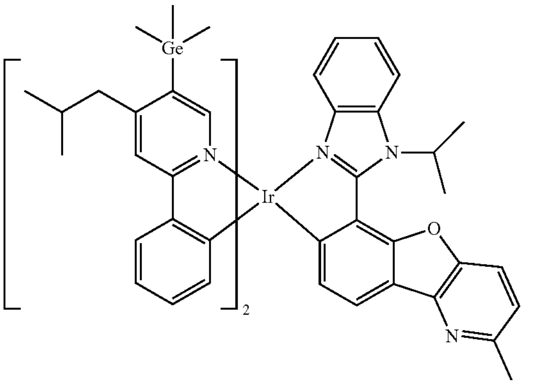
-continued
1859
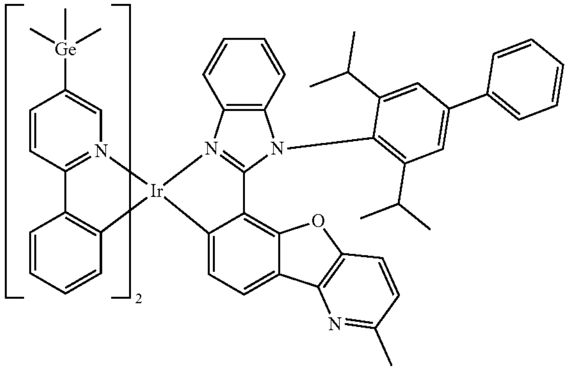
1860
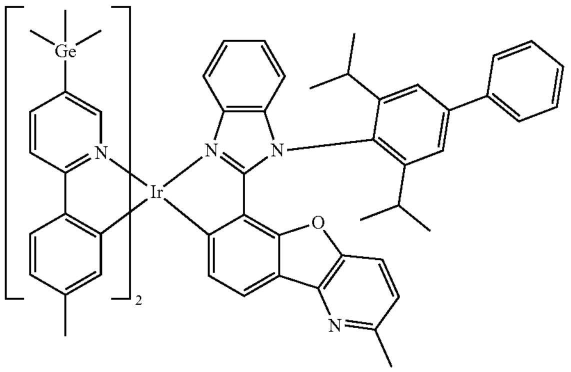
1861
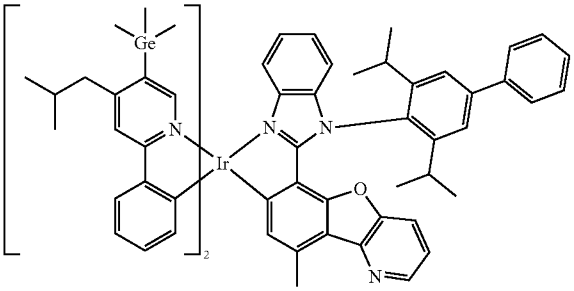
1862
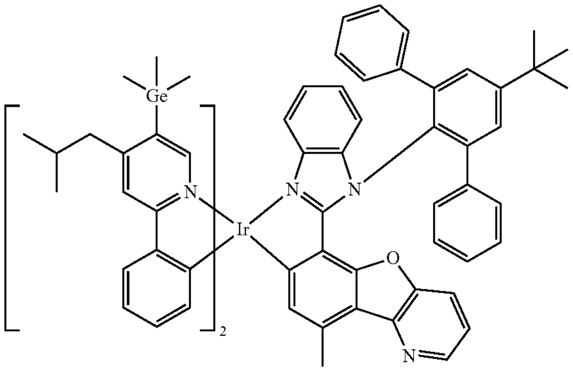

-continued
1863
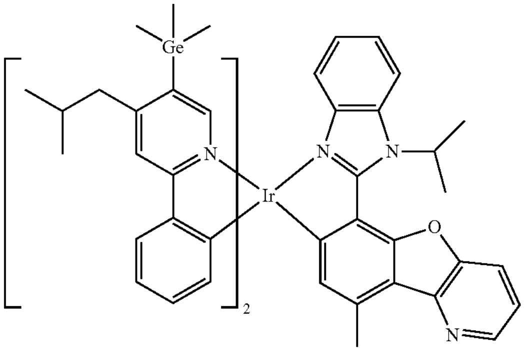
1864
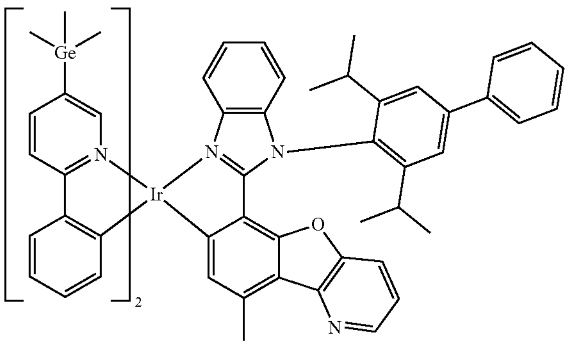
1865
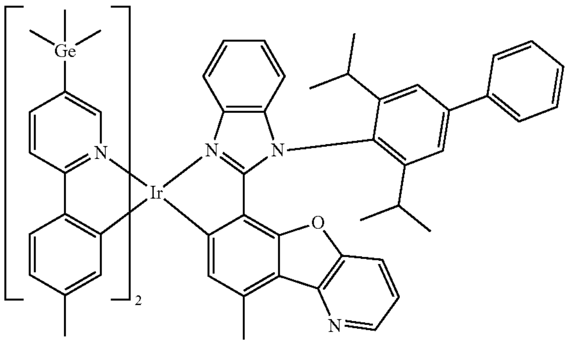
1866
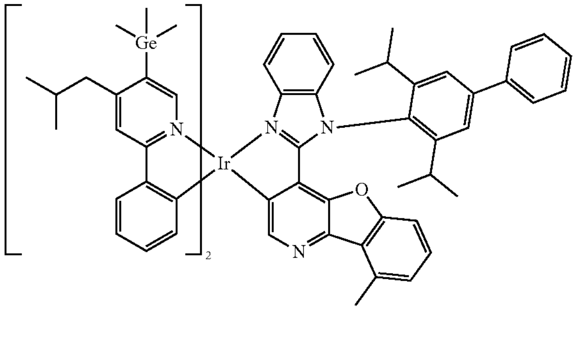
-continued
1867
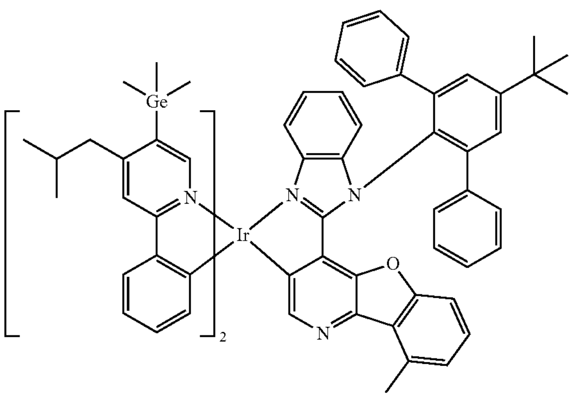
1868
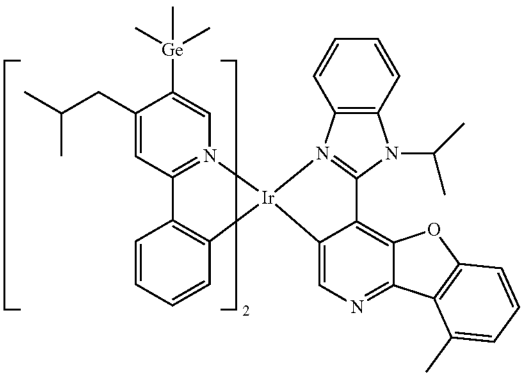
1869
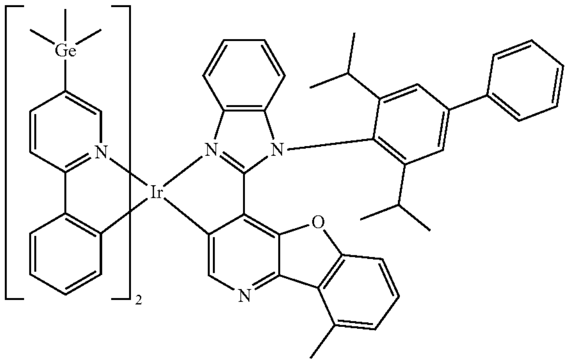
1870
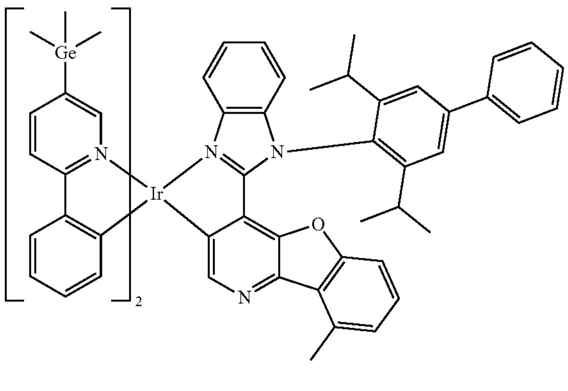

-continued
1871
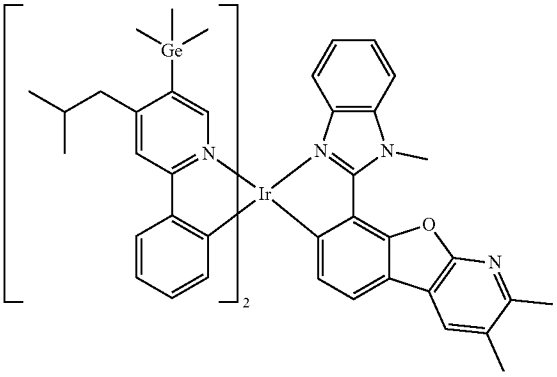
1872
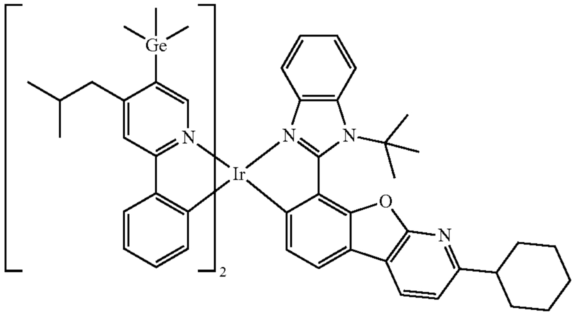
1873
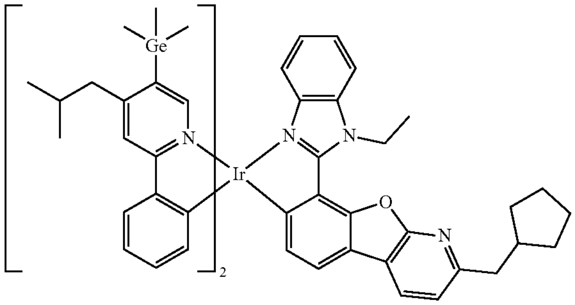
1874
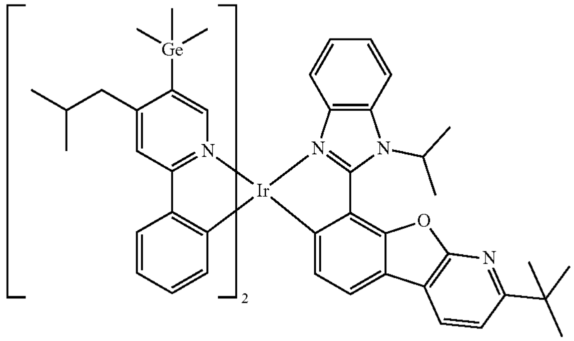
-continued
1875
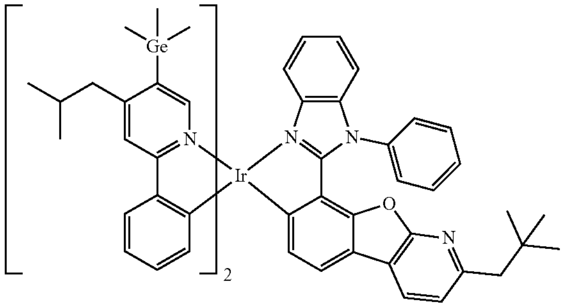
1876
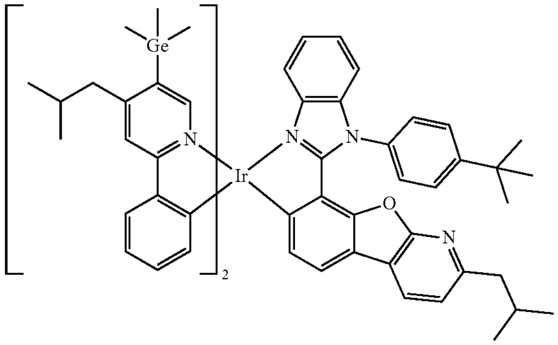
1877
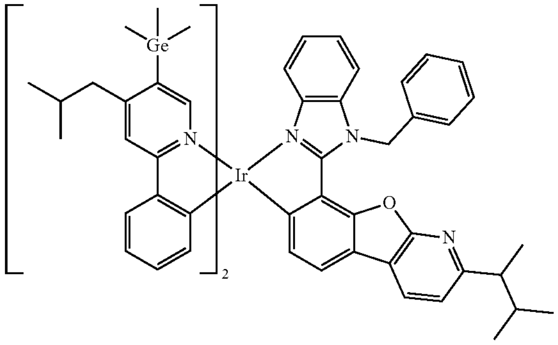
1878
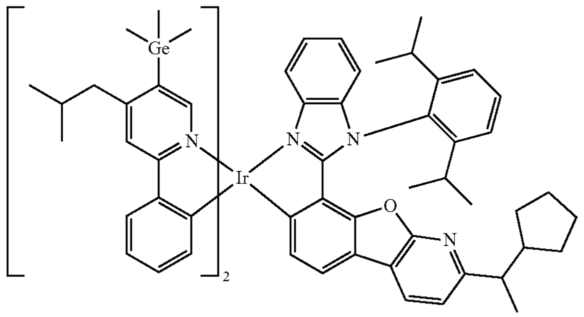

-continued
1879
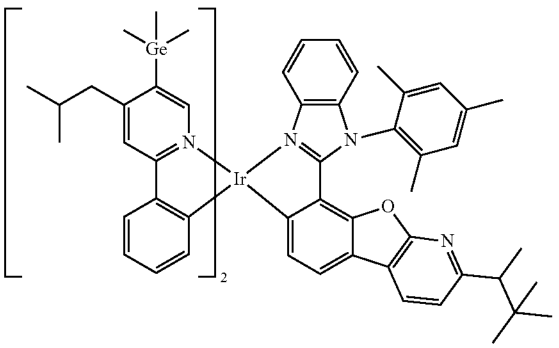
1880
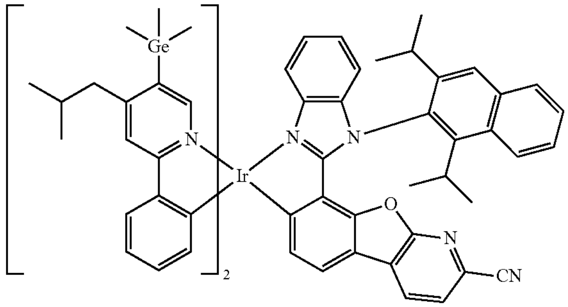
1881
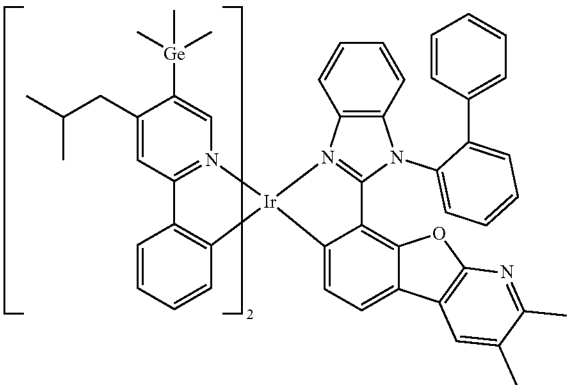
1882
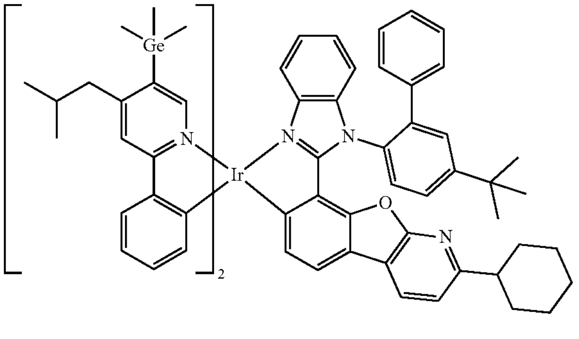
-continued
1883
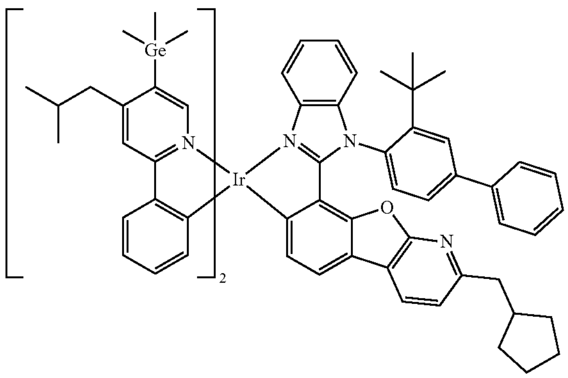
1884
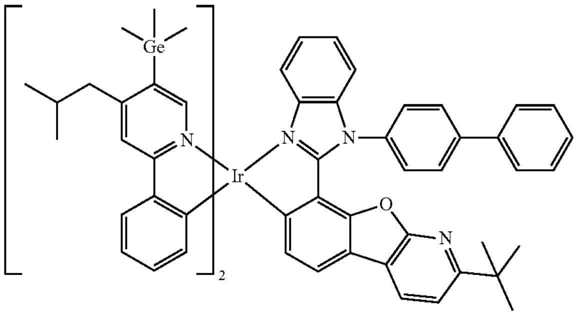
1885
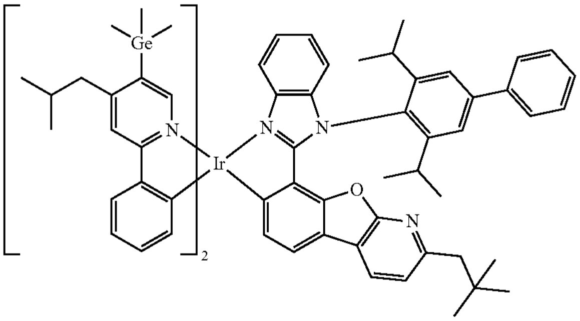
1886
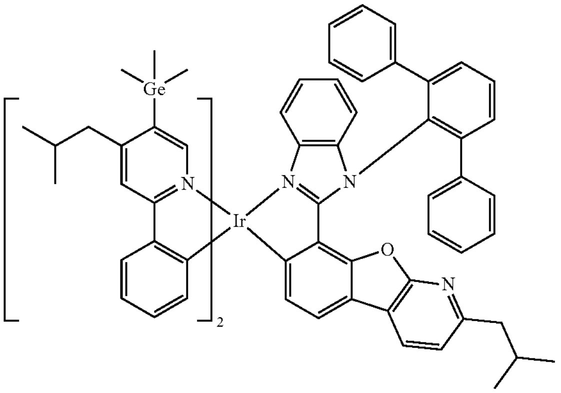

-continued
1887
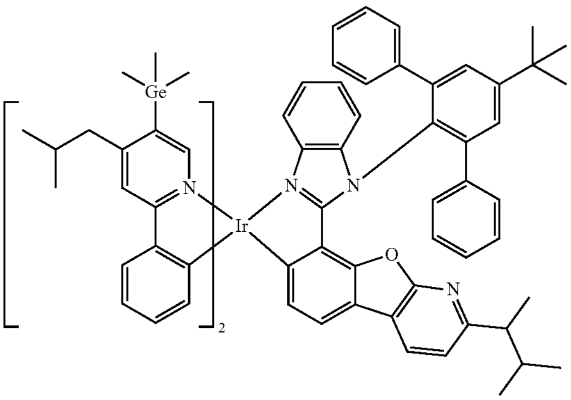
1888
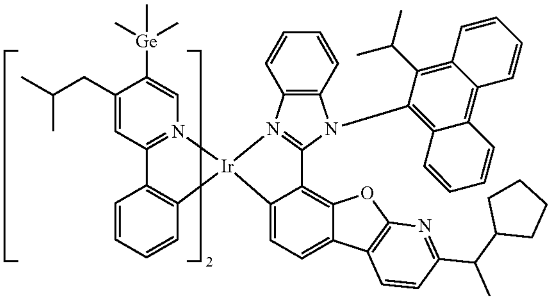
1889
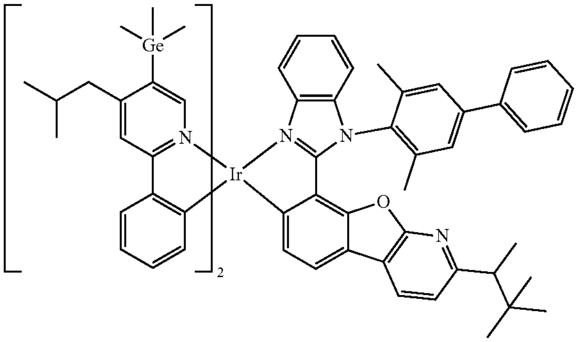
1890
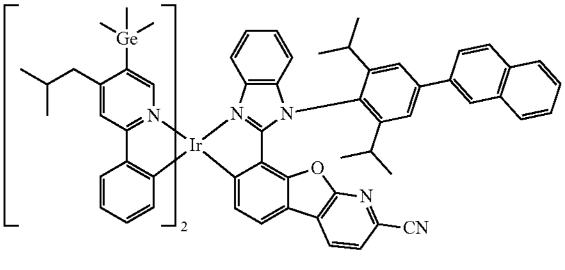
-continued
1891
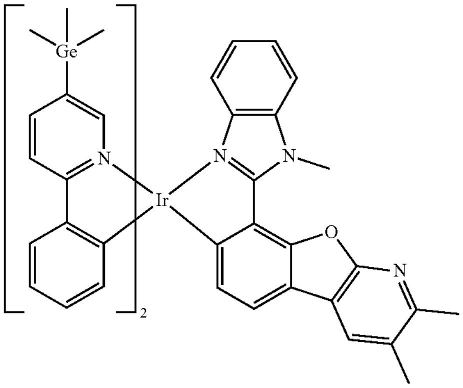
1892
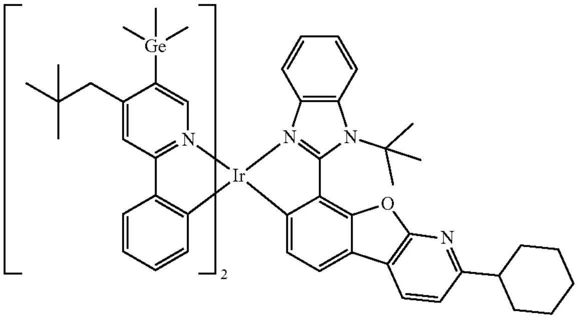
1893
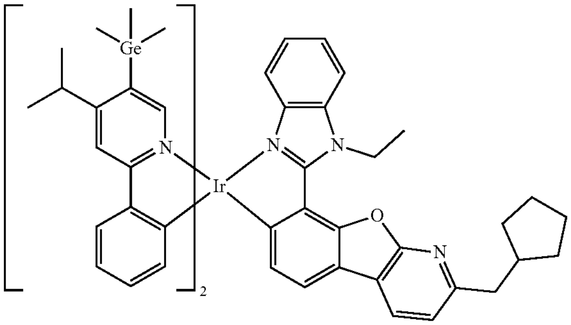
1894
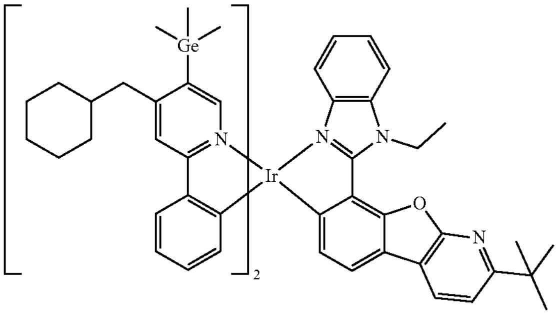

-continued
1895
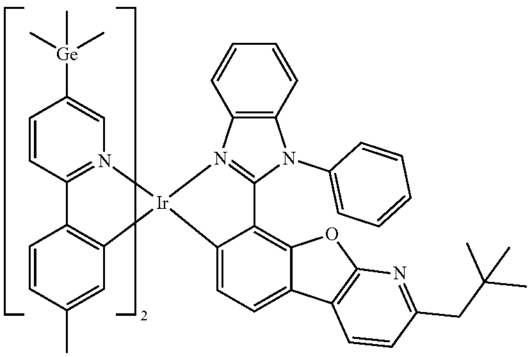
1896
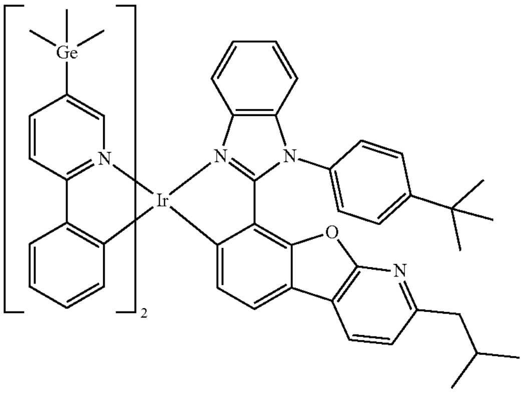
1897
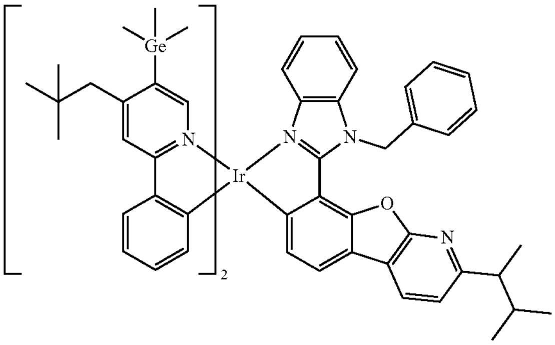
1898
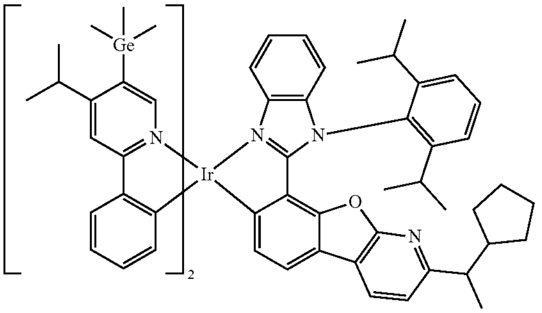
-continued
1899
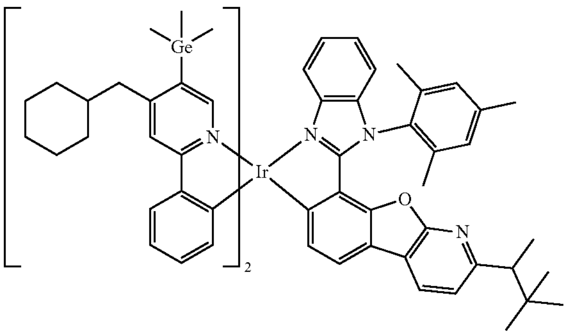
1900
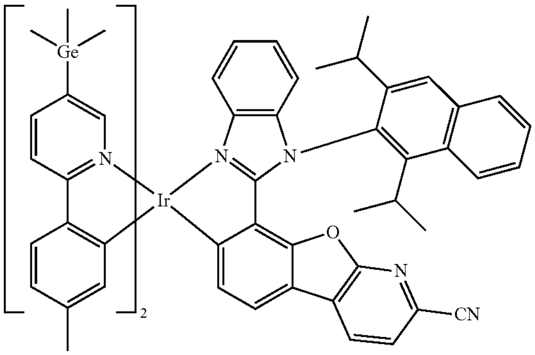
1901
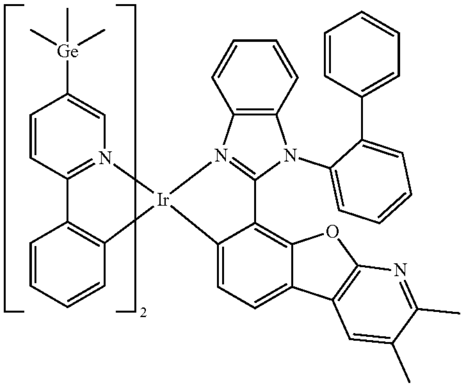
1902
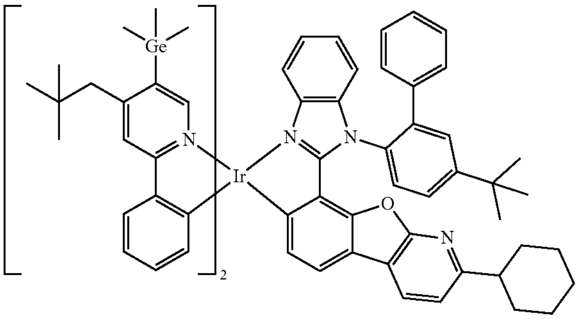

-continued
1903
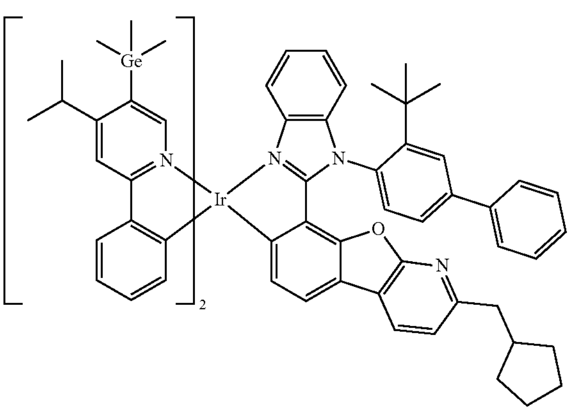
1904
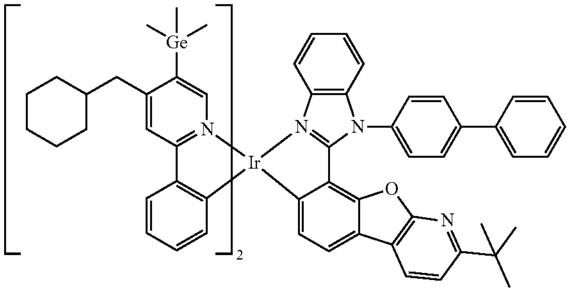
1905
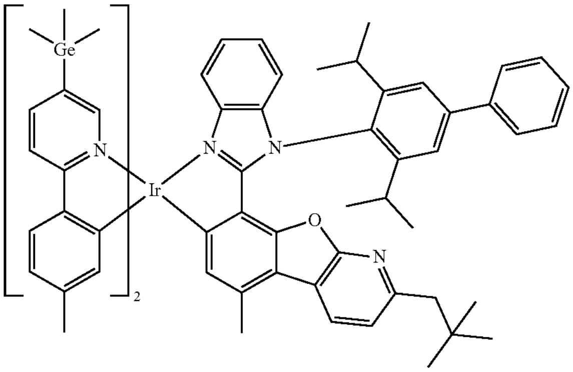
1906
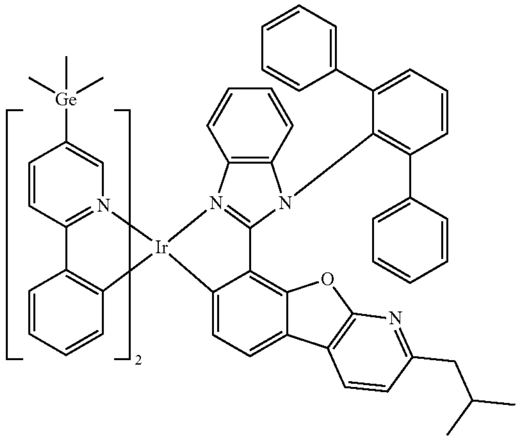
-continued
1907
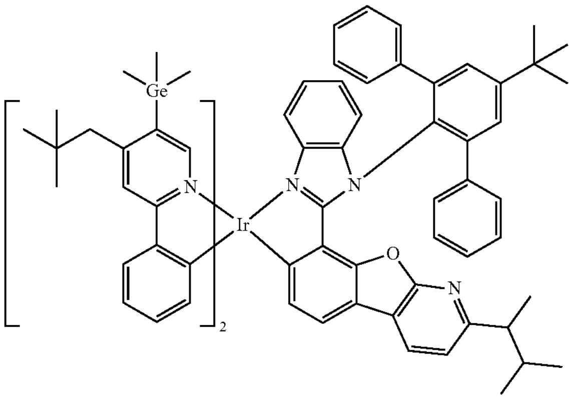
1908
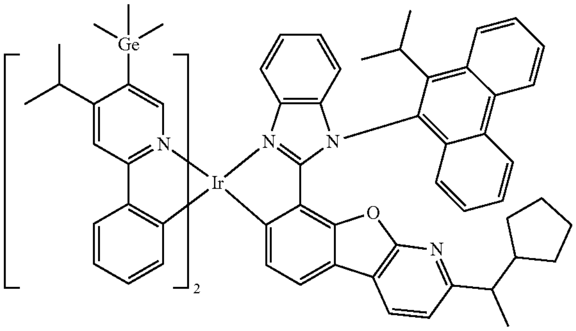
1909
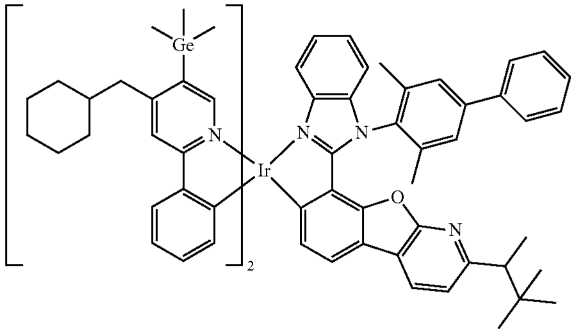
1910
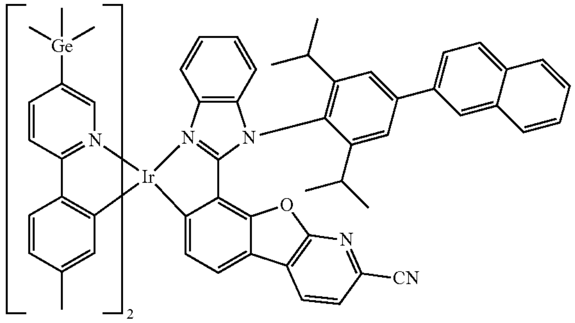

-continued
1911
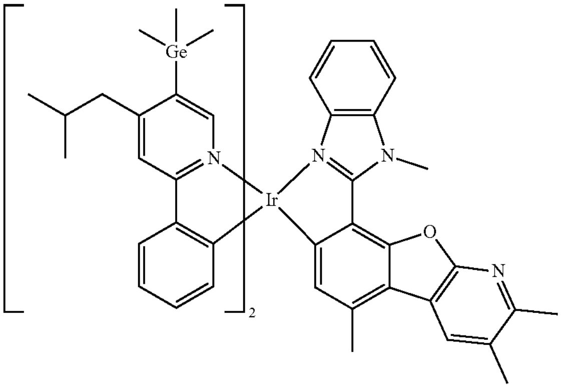
1912
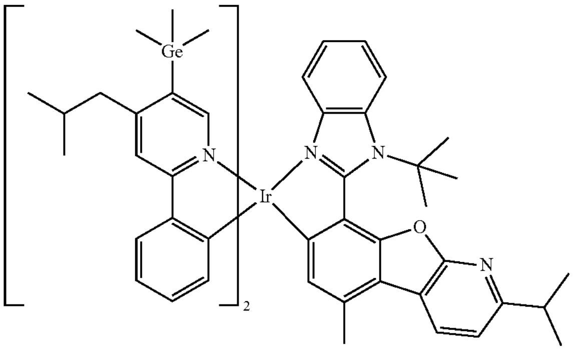
1913
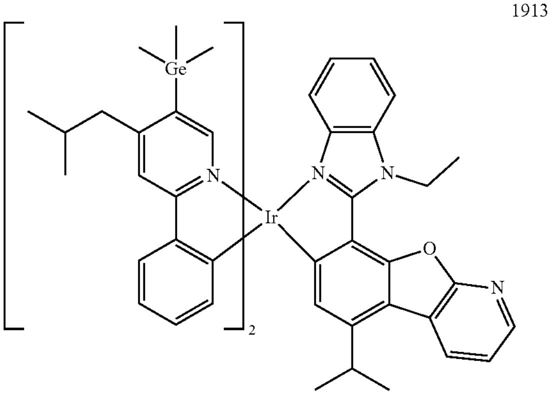
1914
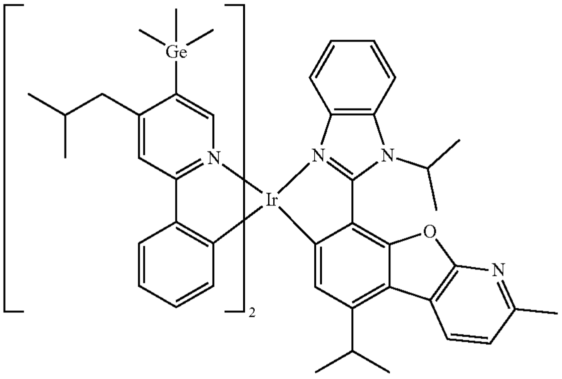
-continued
1915
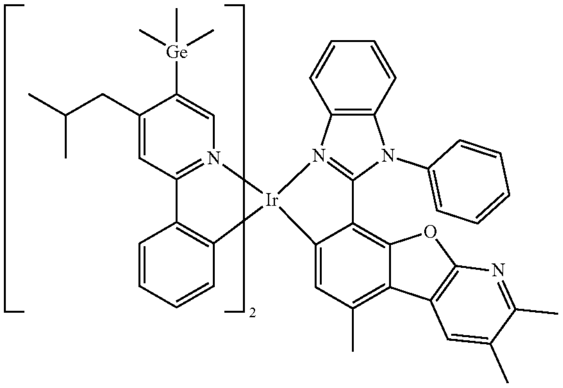
1916
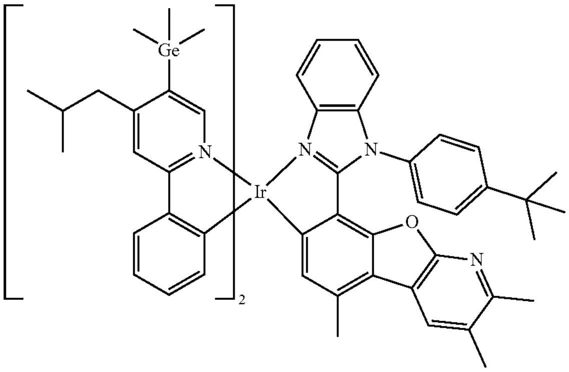
1917
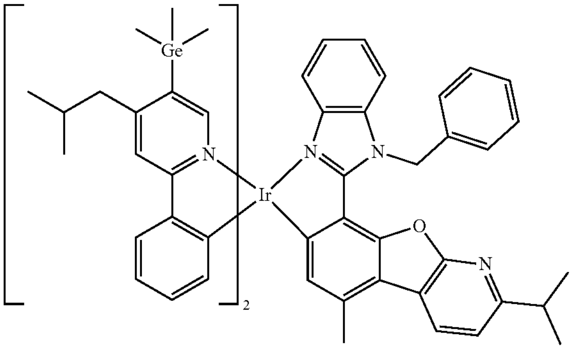
1918
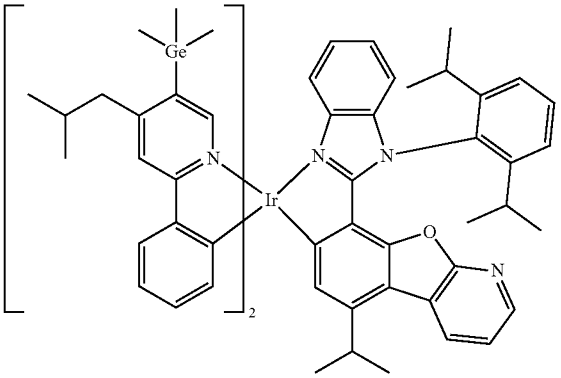

1919
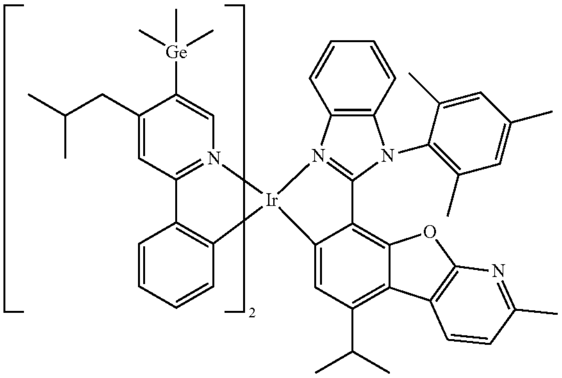
1920
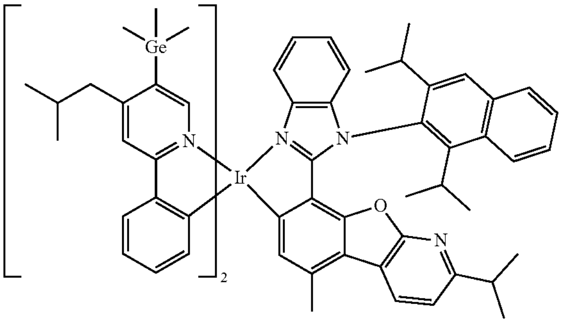
1921
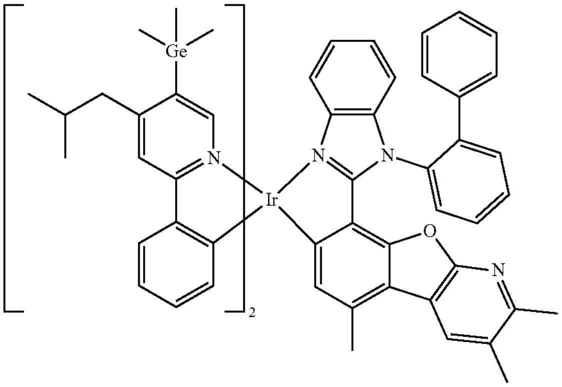
1922
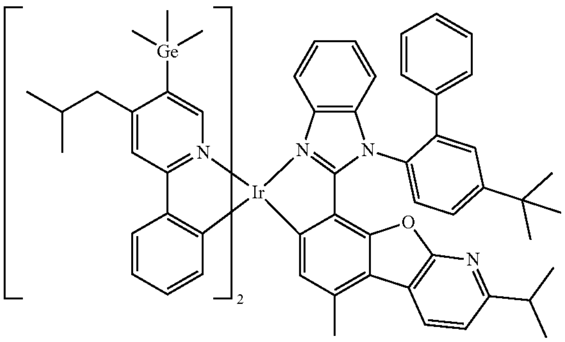
1923
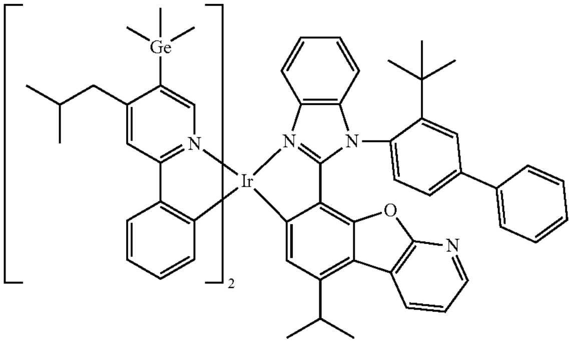
1924
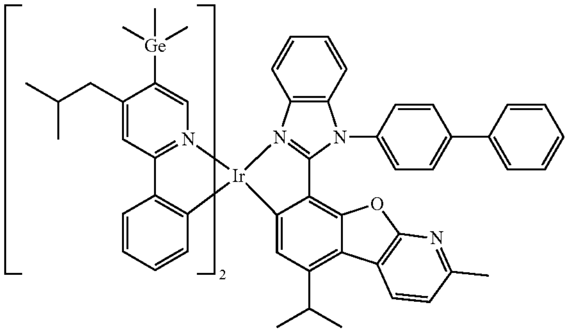
1925
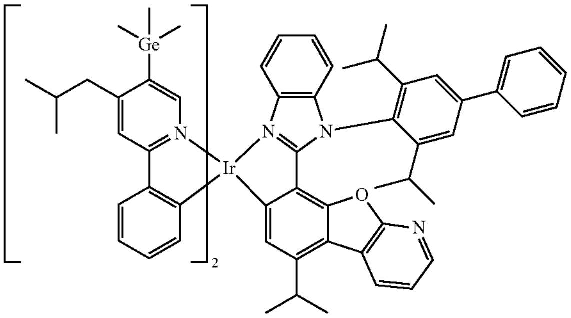
1926
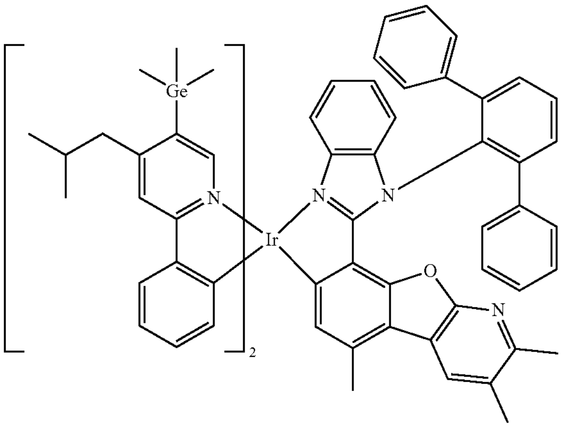

-continued
1927
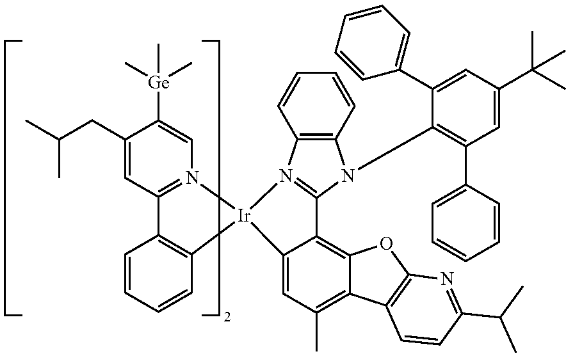
1928
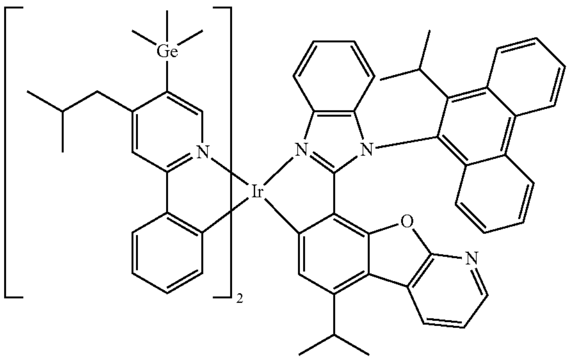
1929
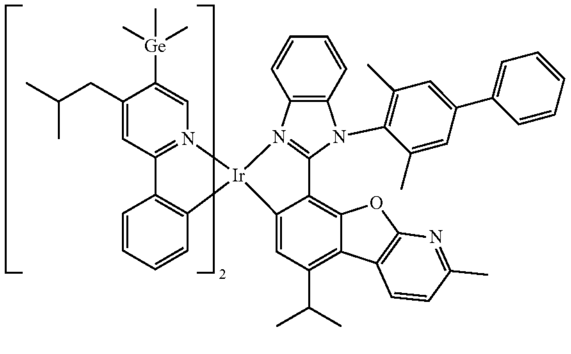
1930
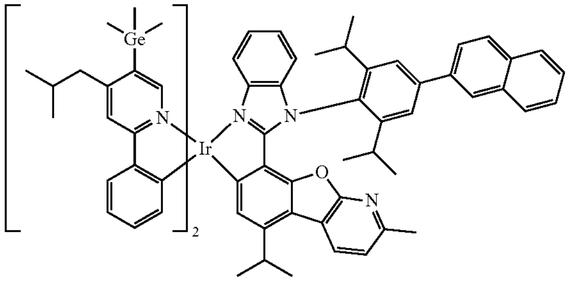
-continued
1931
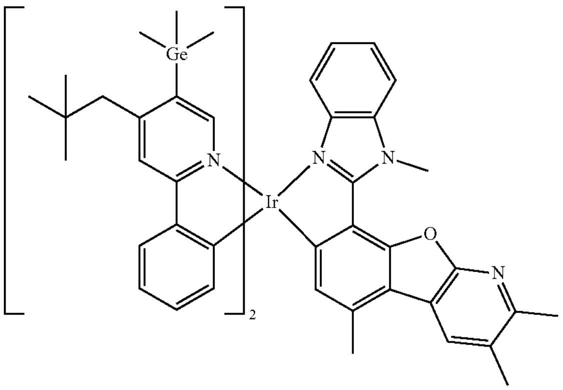
1932
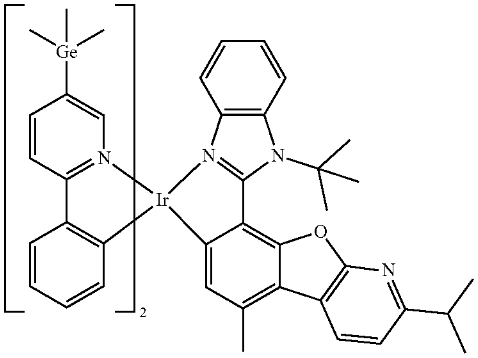
1933
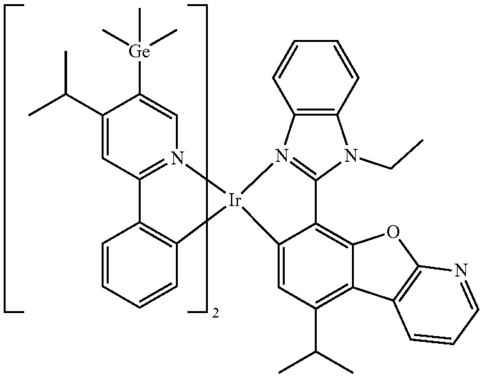
1934
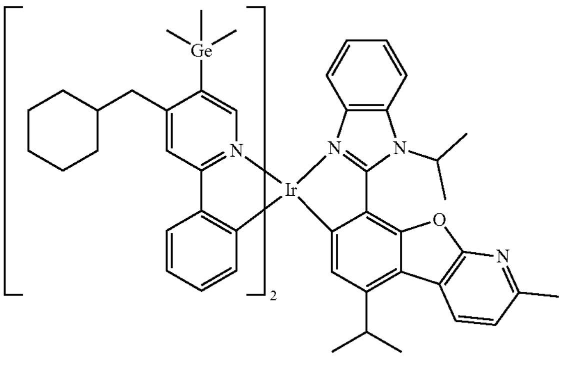

-continued
1935
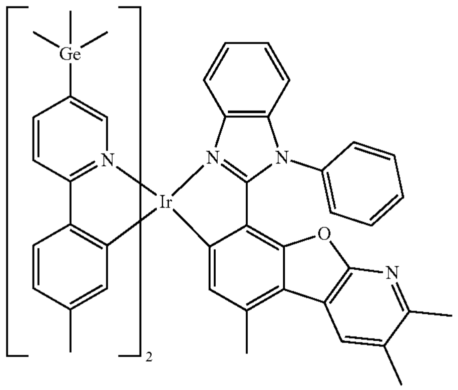
1936
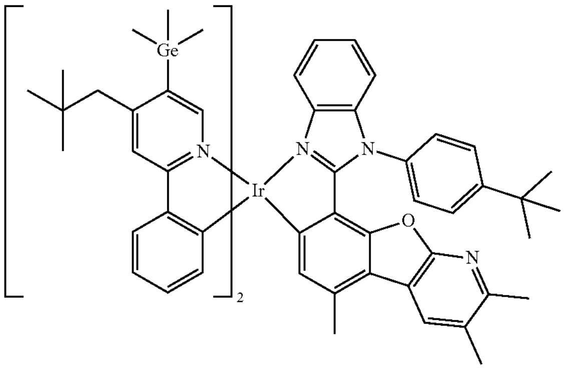
1937
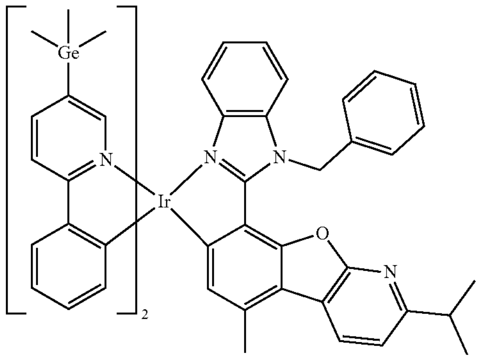
1938
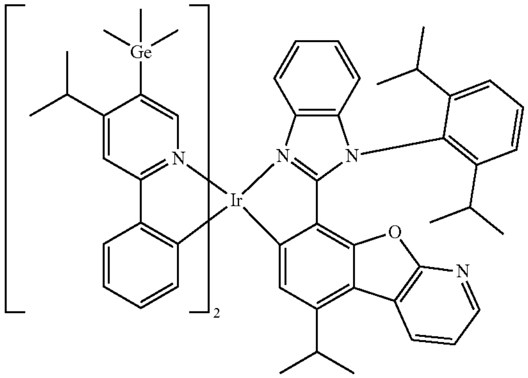
-continued
1939
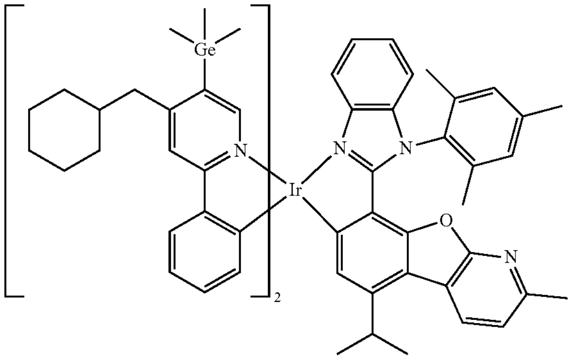
1940
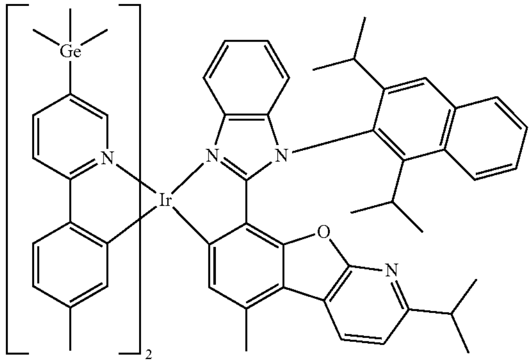
1941
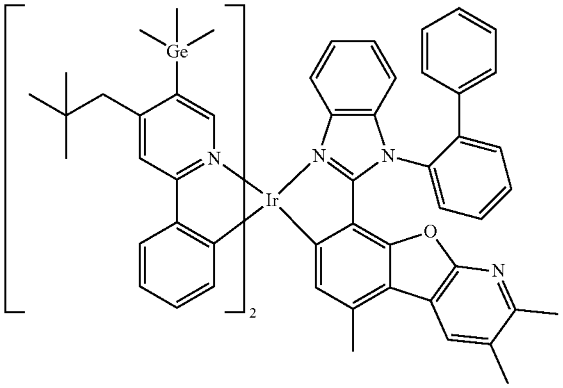
1942
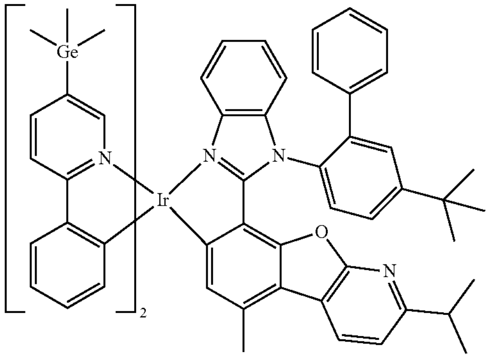

1943
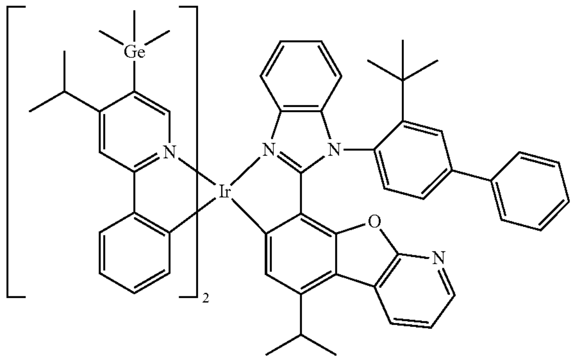
1944
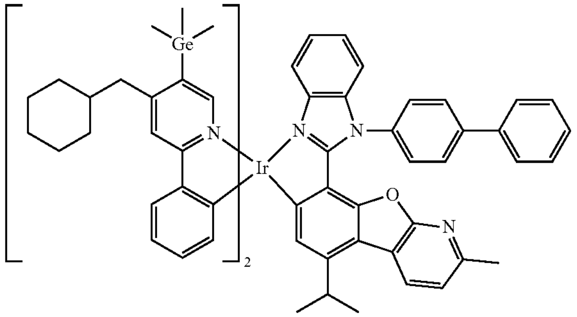
1945
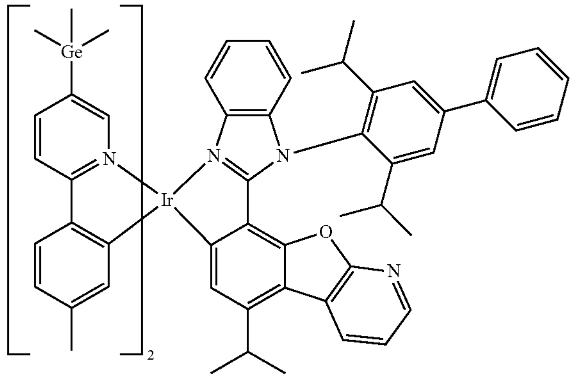
1946
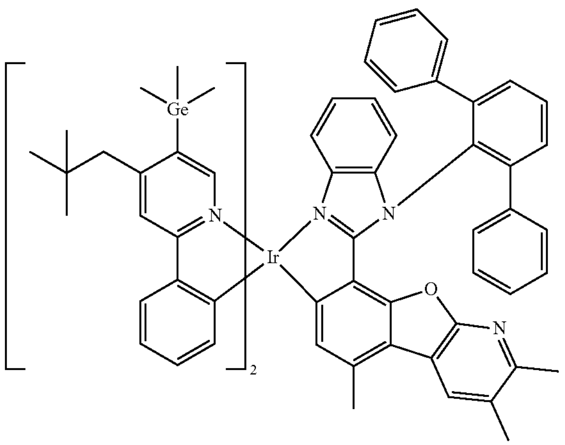
1947
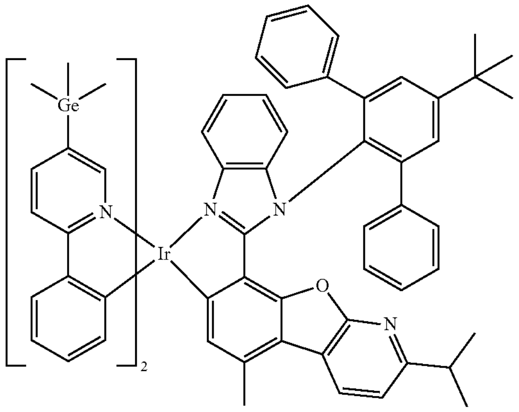
1948
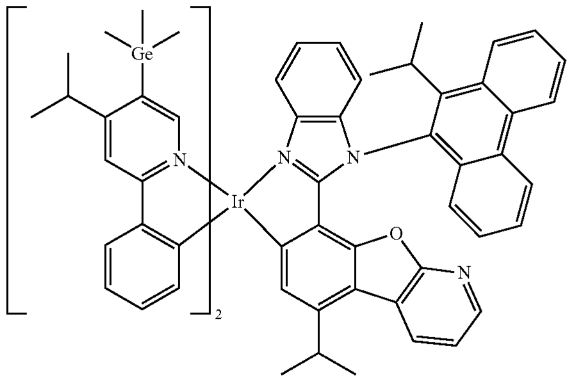
1949
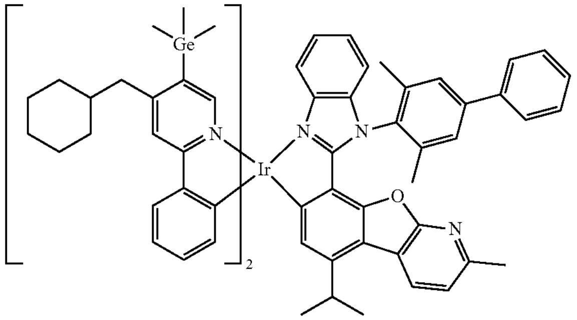
1950
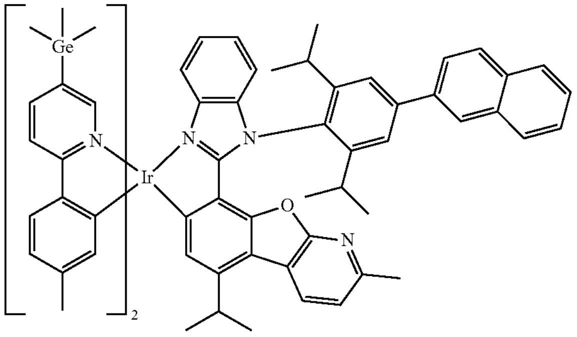

-continued
1951
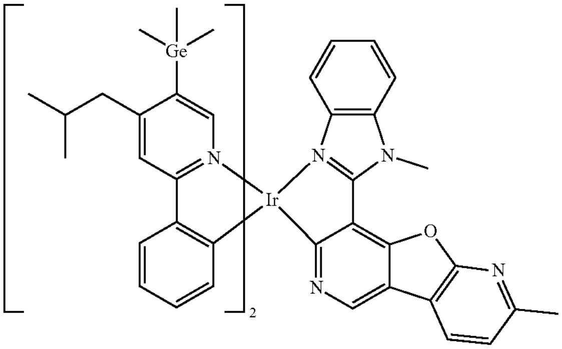
1952
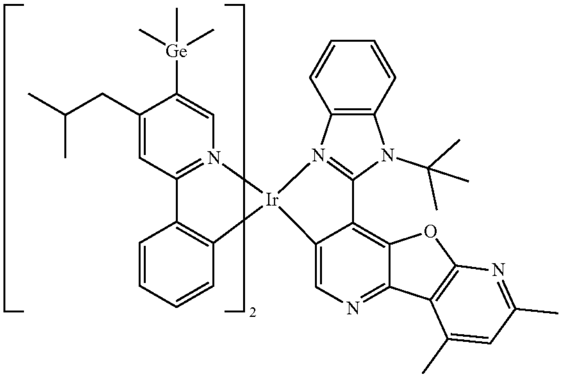
1953
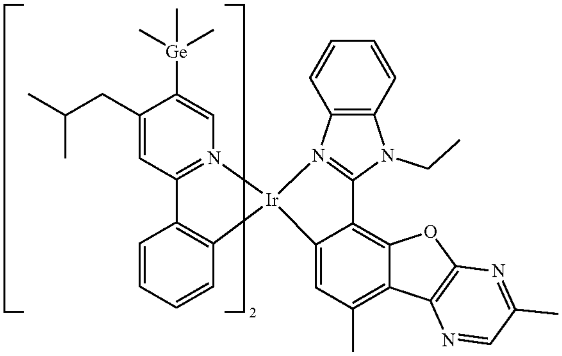
1954
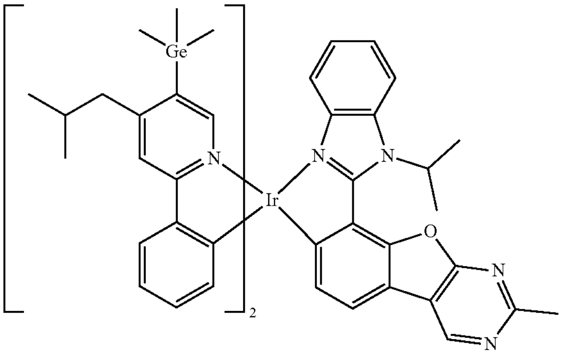
-continued
1955
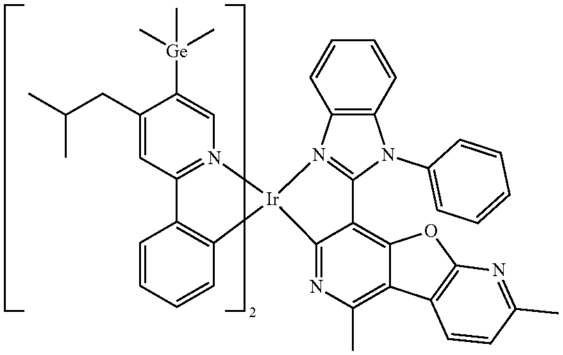
1956
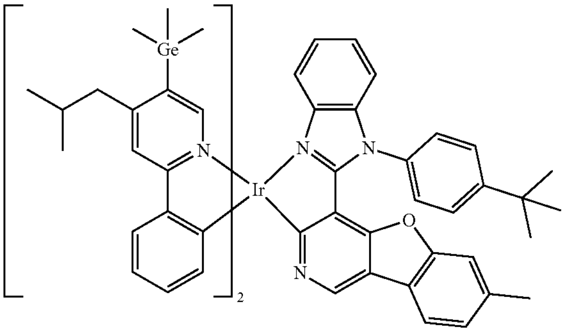
1957
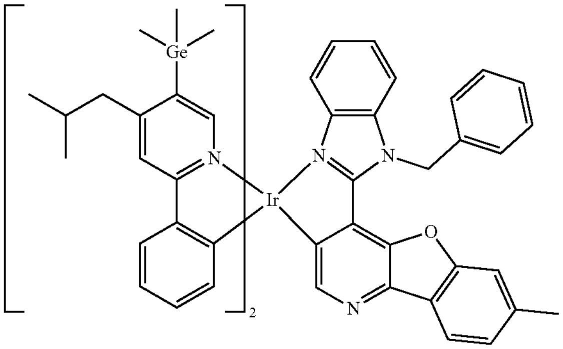
1958
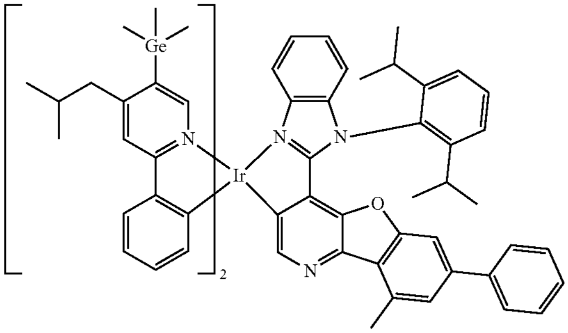

-continued
1959
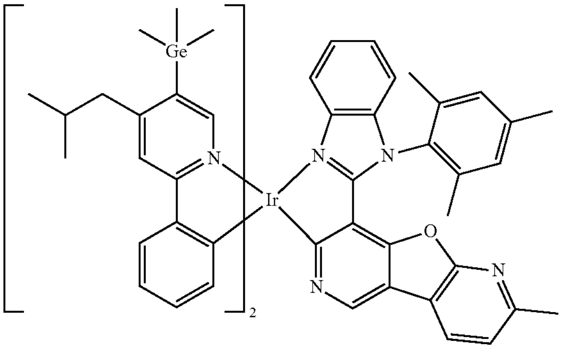
1960
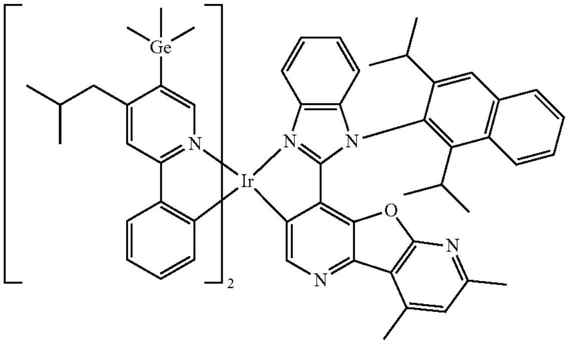
1961
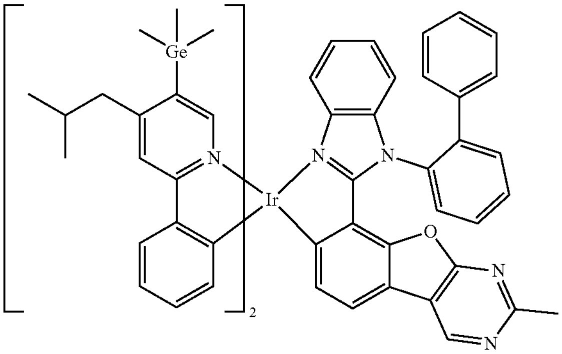
1962
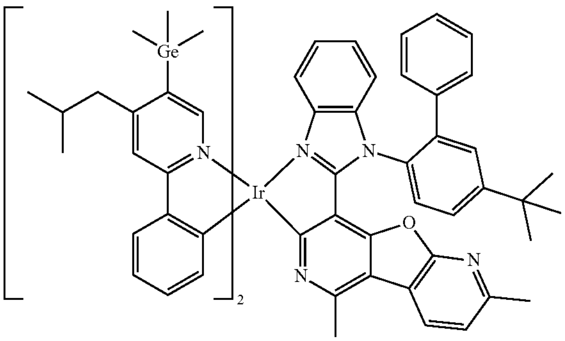
-continued
1963
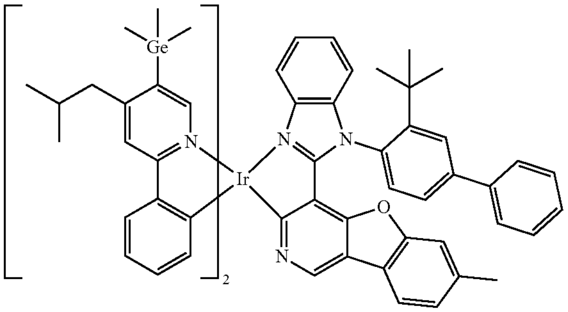
1964
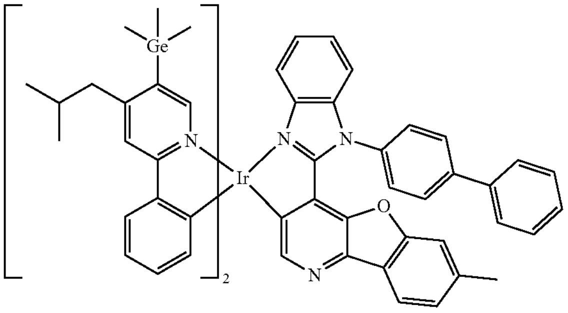
1965
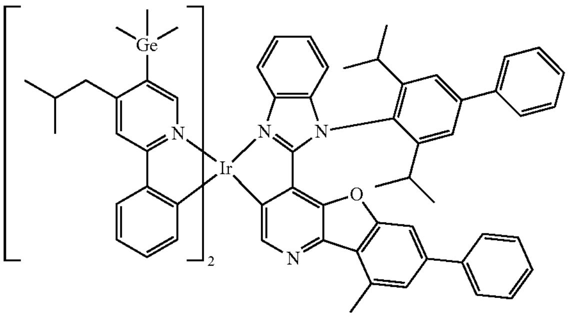
1966
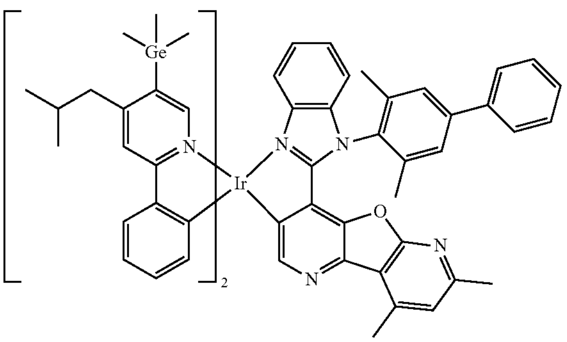

-continued
1967
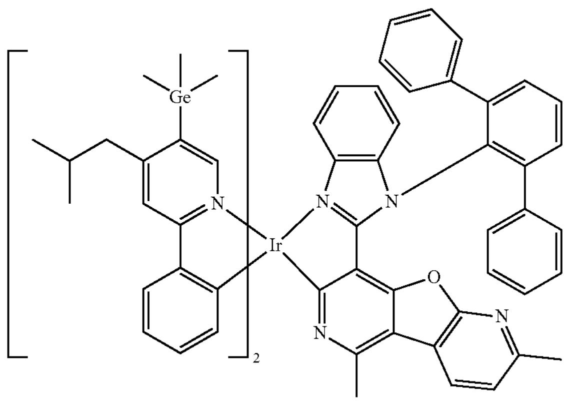
1968
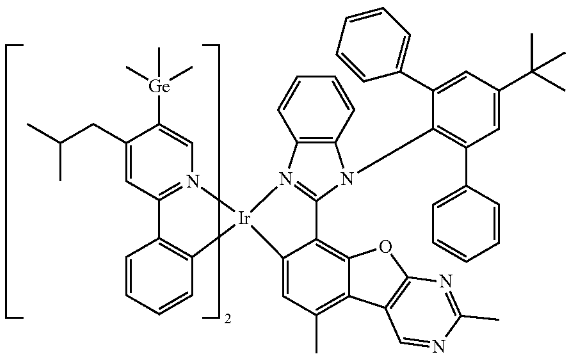
1969
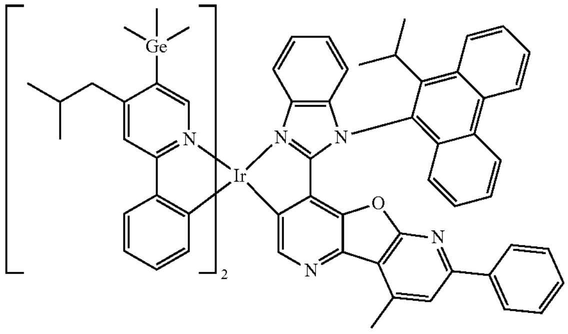
1970
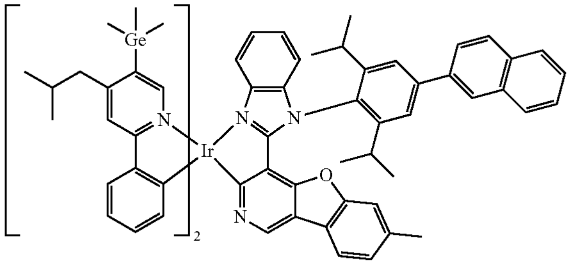
-continued
1971
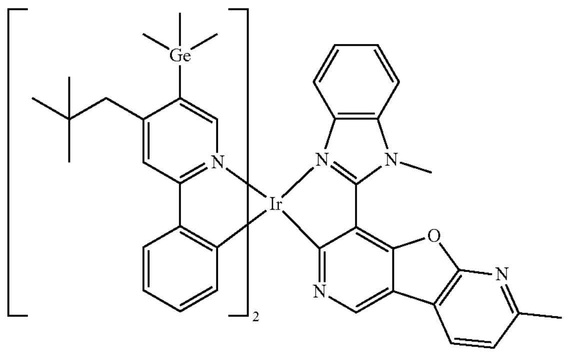
1972
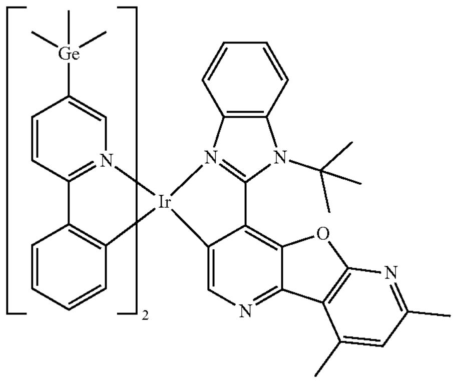
1973
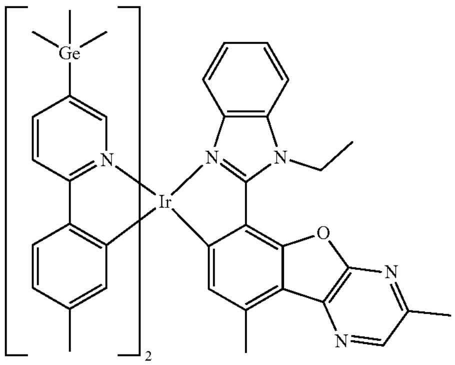
1974
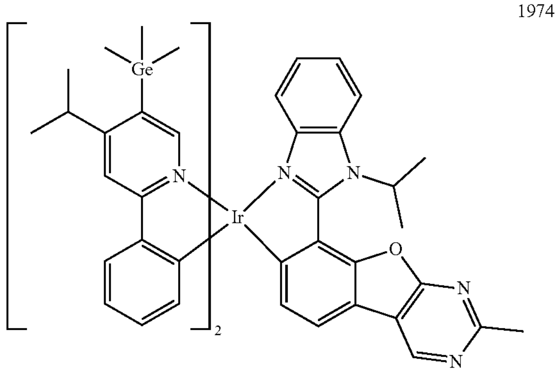

-continued
1975
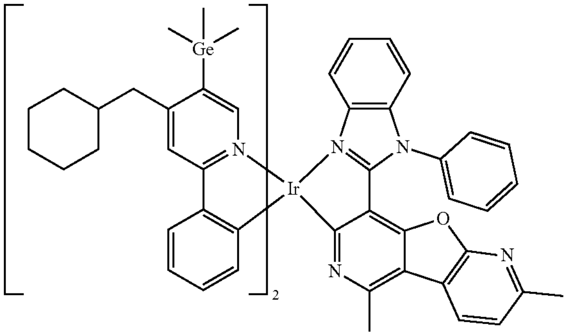
1976
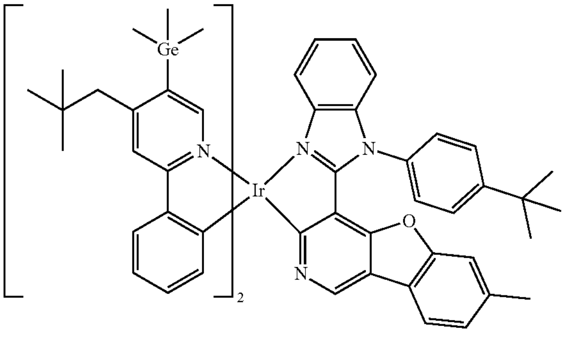
1977
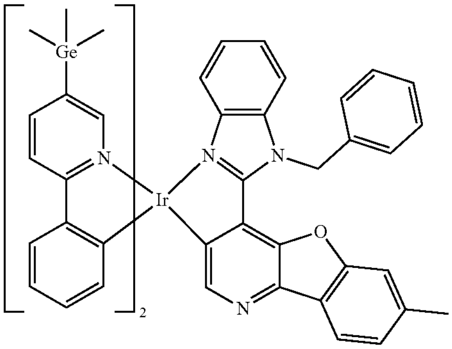
1978
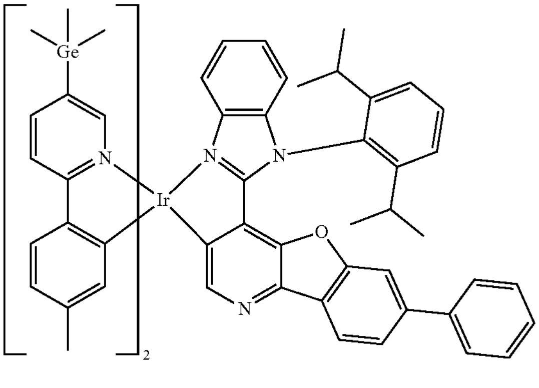
-continued
1979
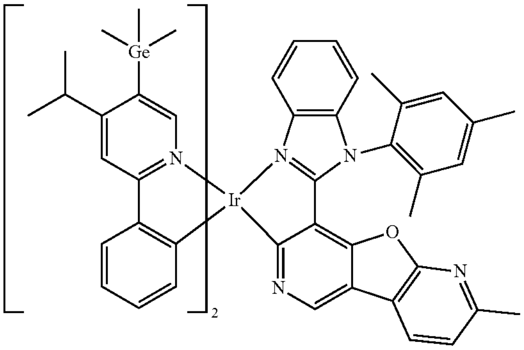
1980
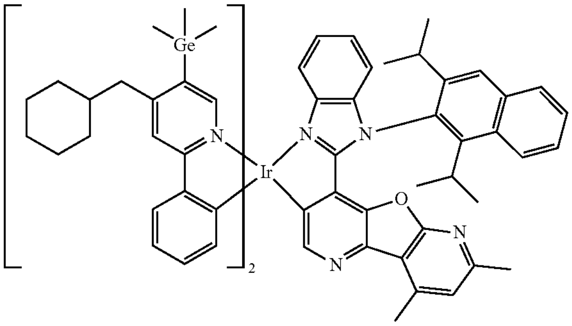
1981
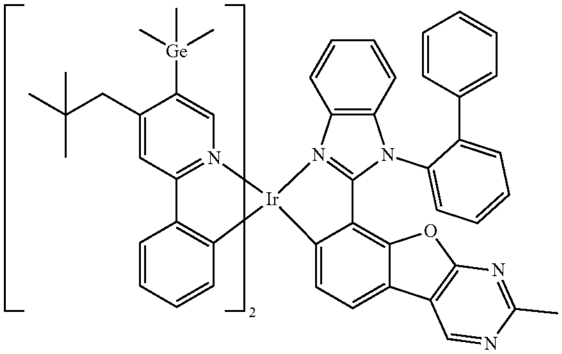
1982
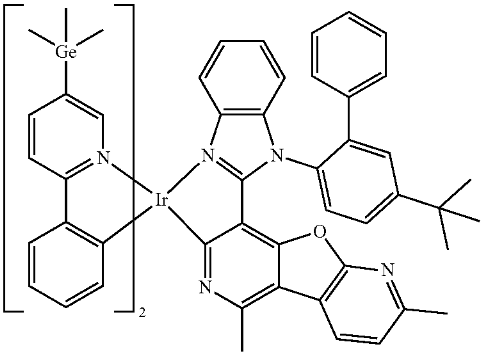

-continued
1983
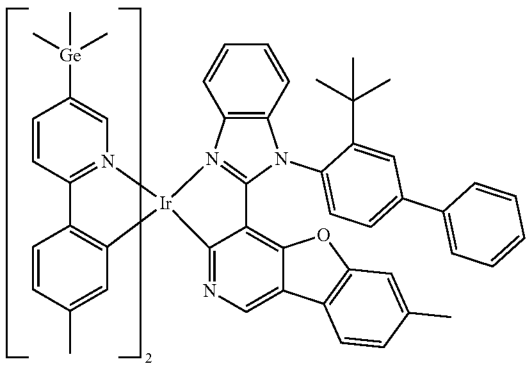
1984
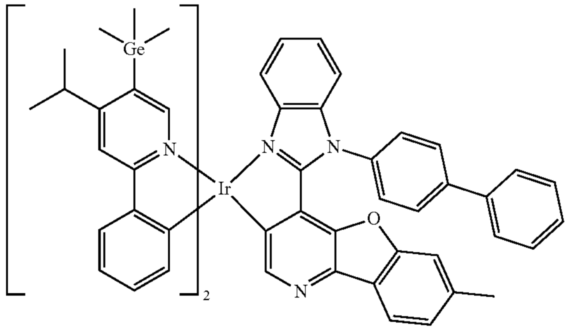
1985
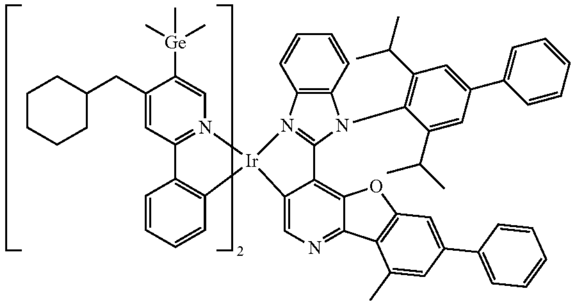
1986
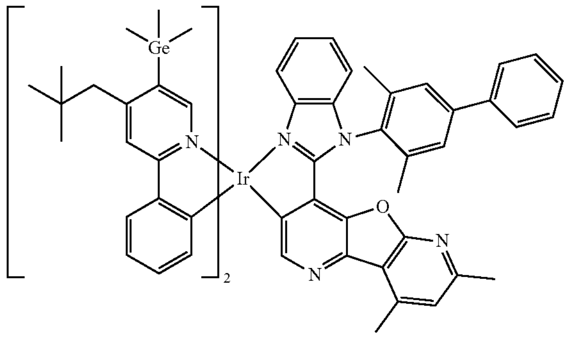
-continued
1987
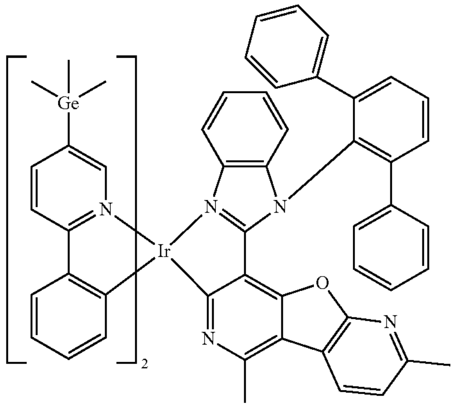
1988
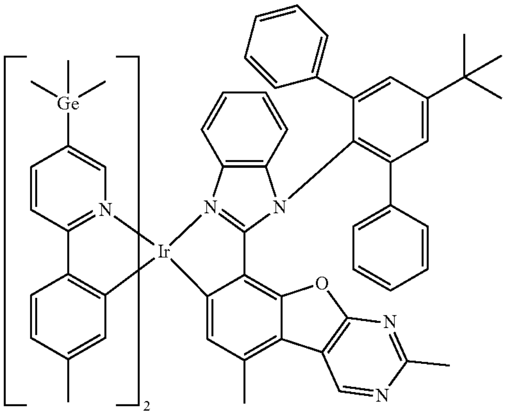
1989
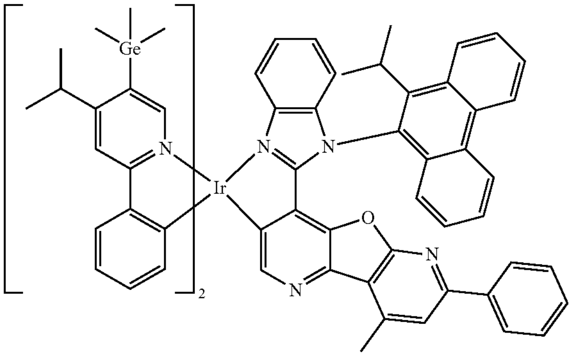
1990
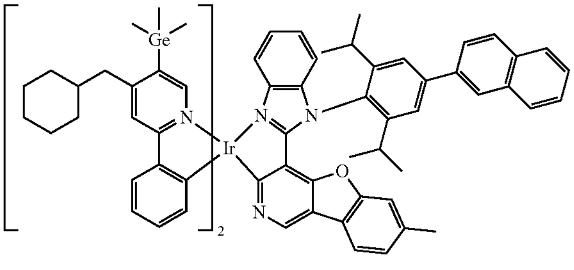

-continued
1991
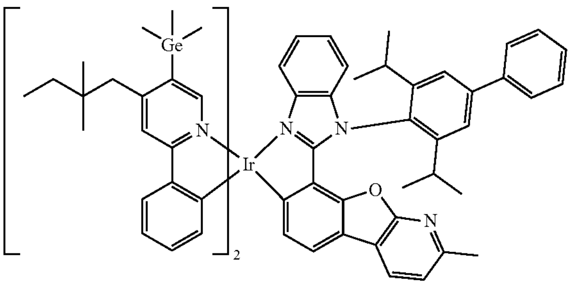
1992
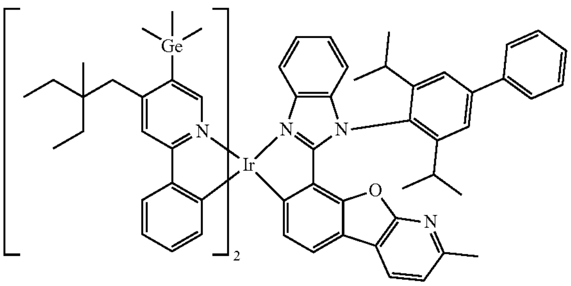
1993
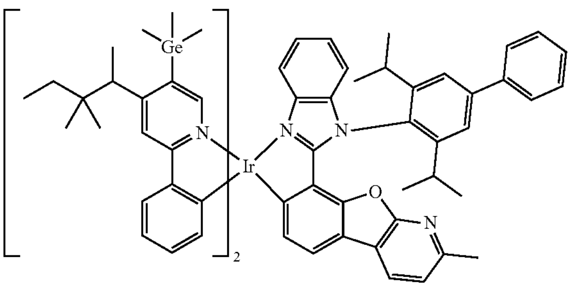
1994
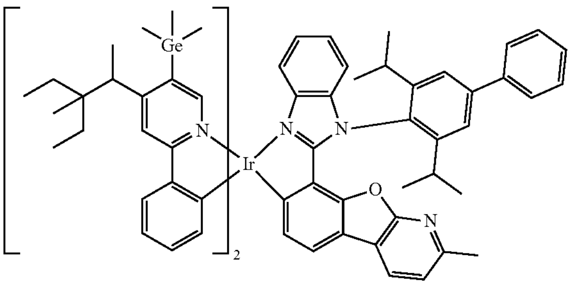
1995
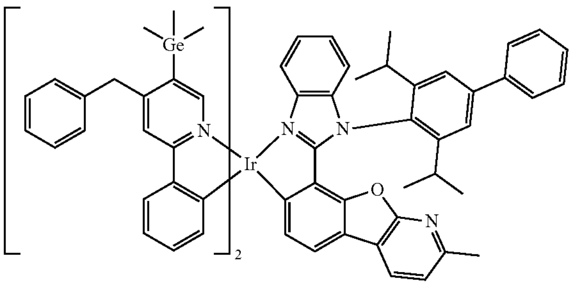
-continued
1996
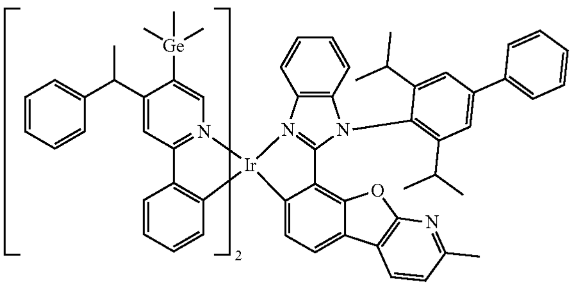
1997
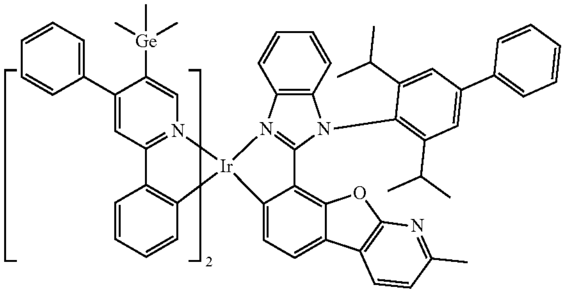
1998
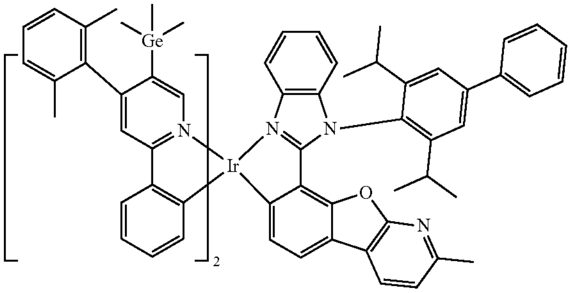
1999
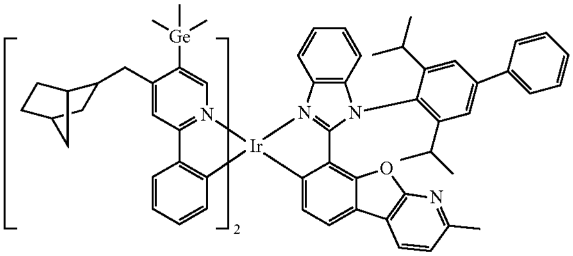
2000
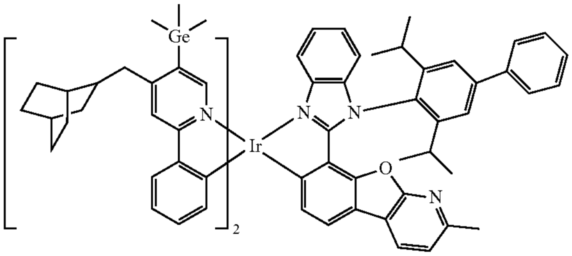

2001
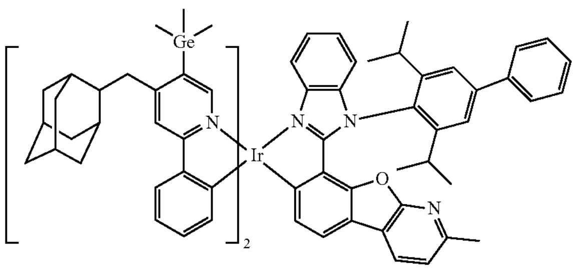
2002
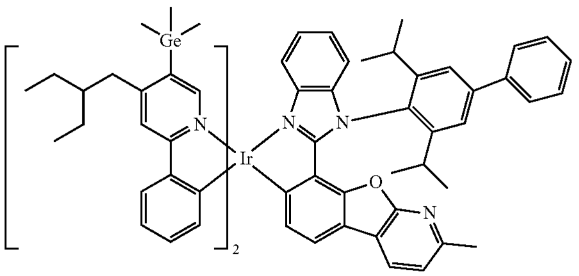
2003
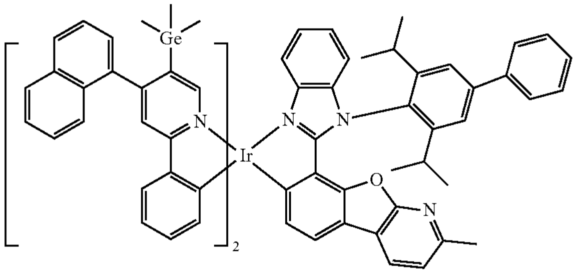
2004
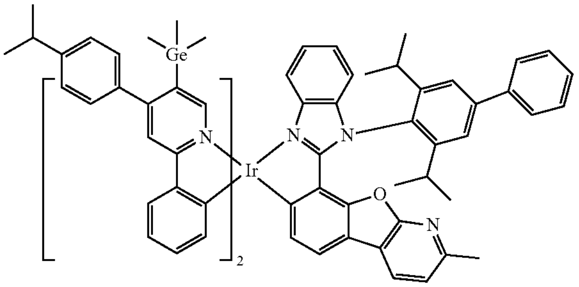
2005
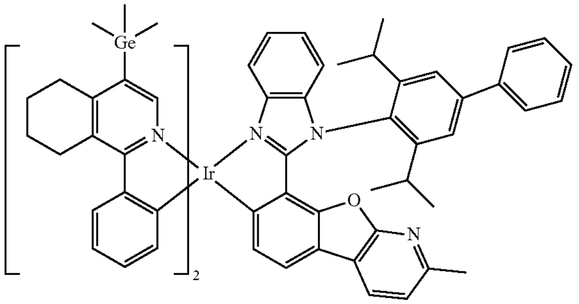
2006
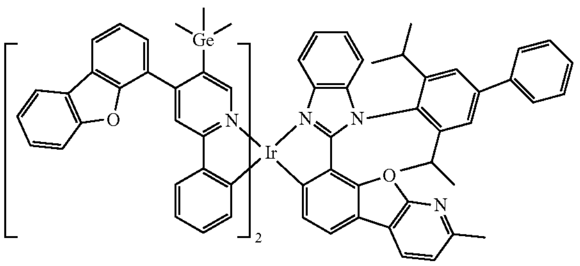
2007
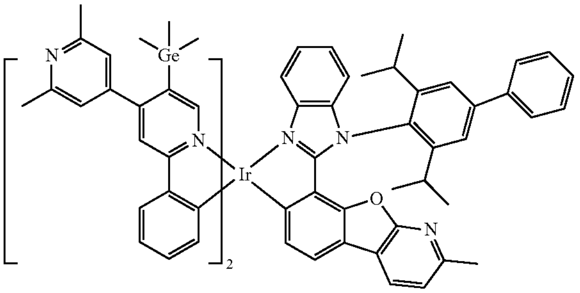
2008
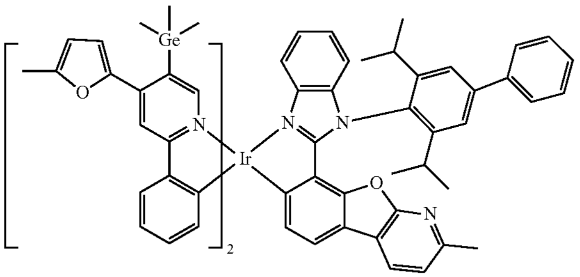
2009
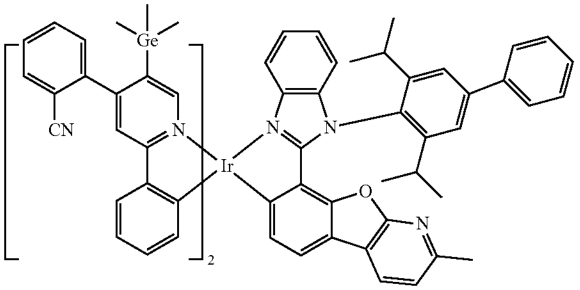
2010
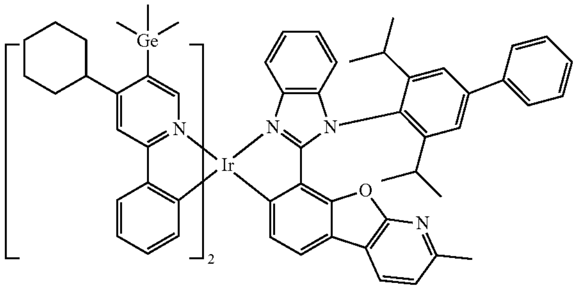

-continued
2011
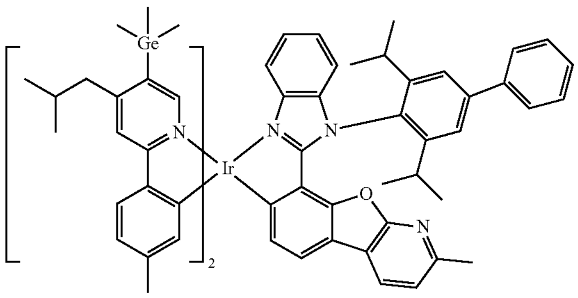
2012
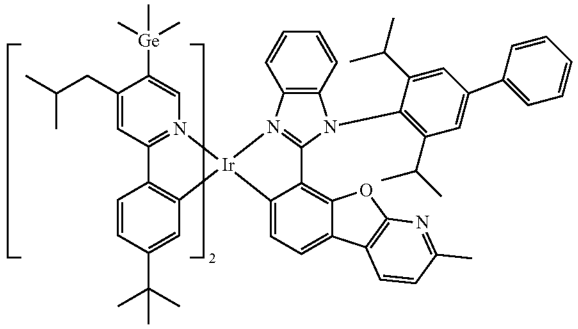
2013
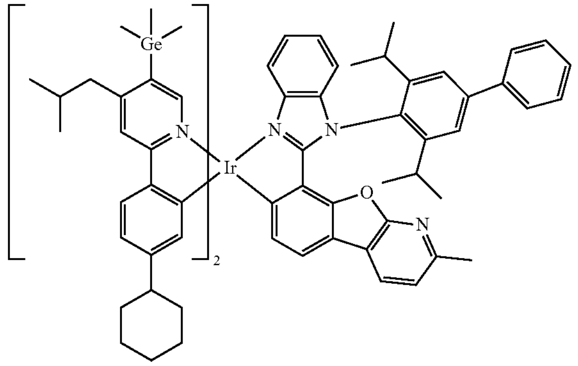
2014
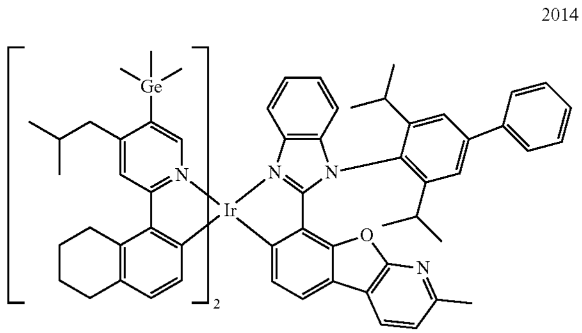
-continued
2015
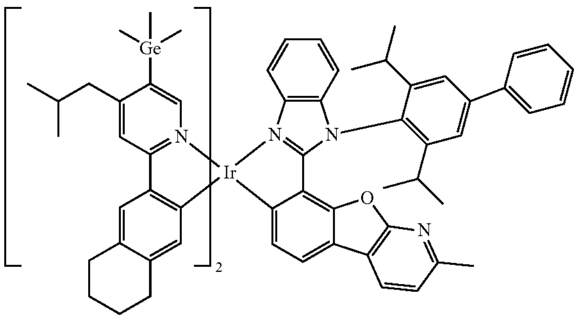
2016
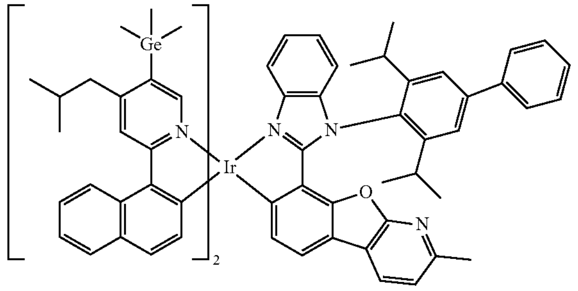
2017
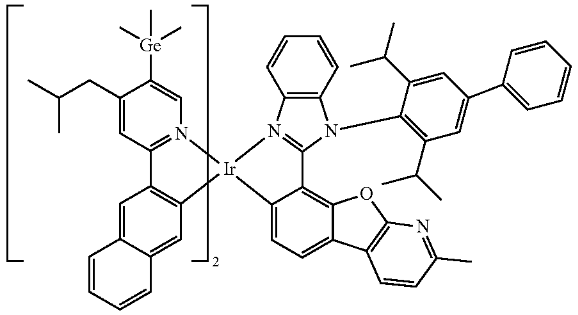
2018
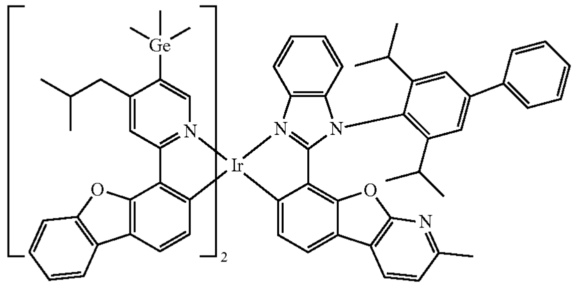
2019
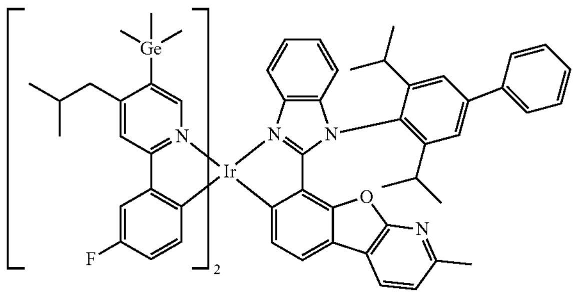

-continued
2020
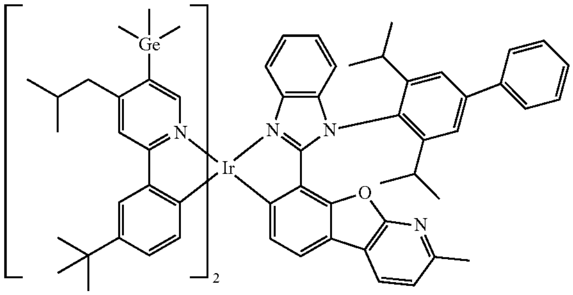
2021
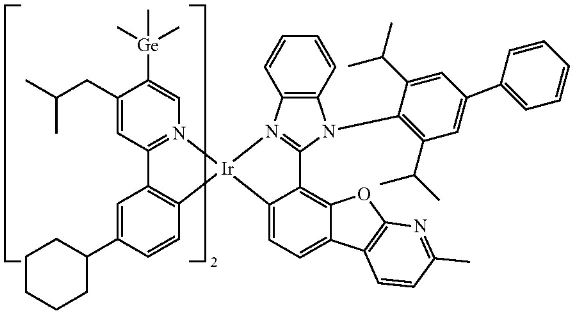
2022
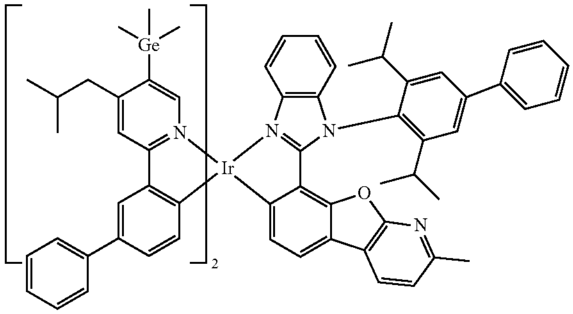
2023
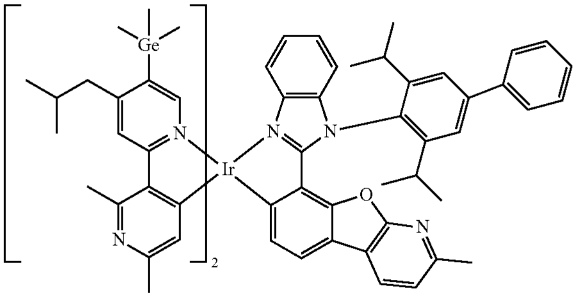
2024
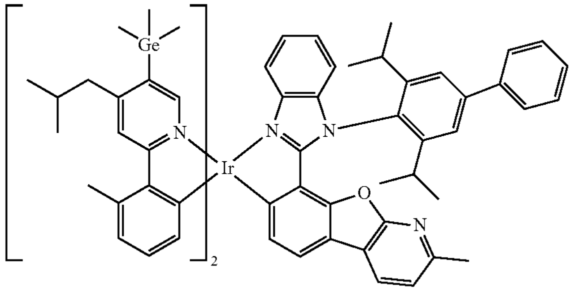
-continued
2025
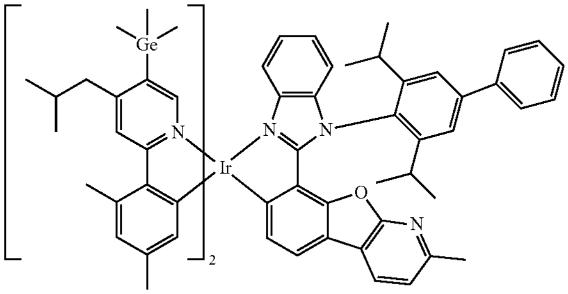
2026
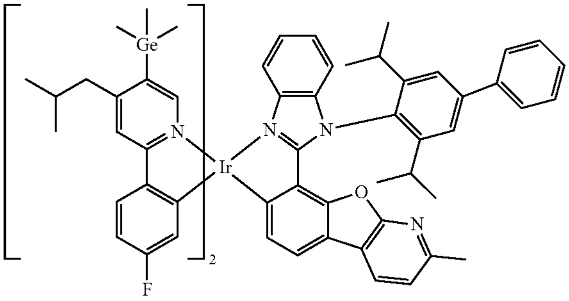
2027
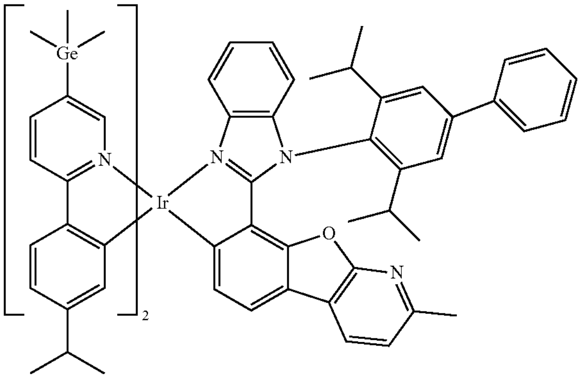
2028
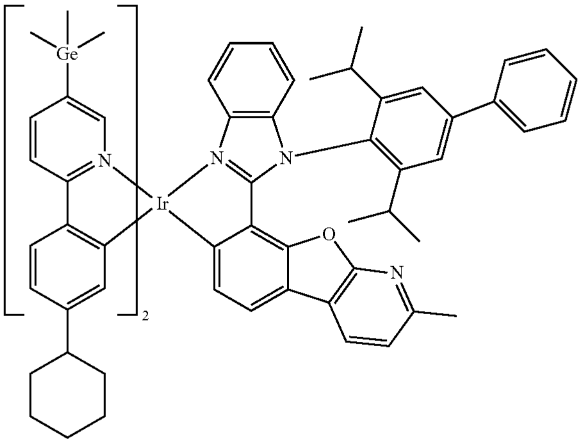

-continued
2029
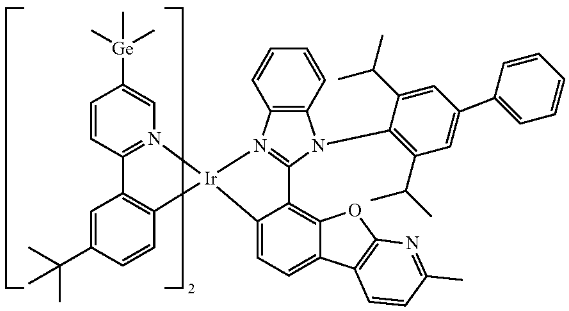
2030
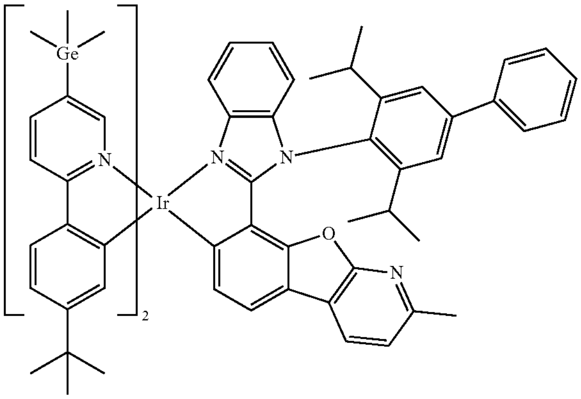
2031
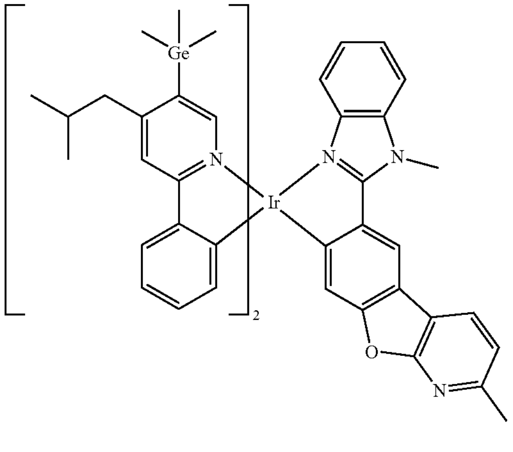
-continued
2032
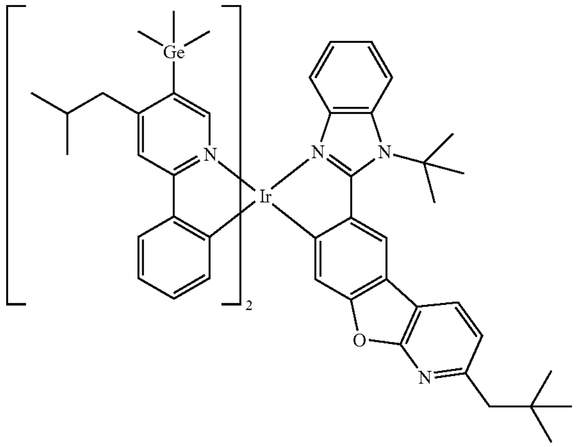
2033
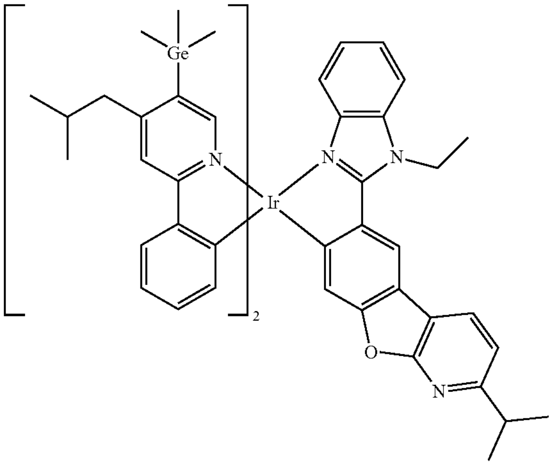
2034
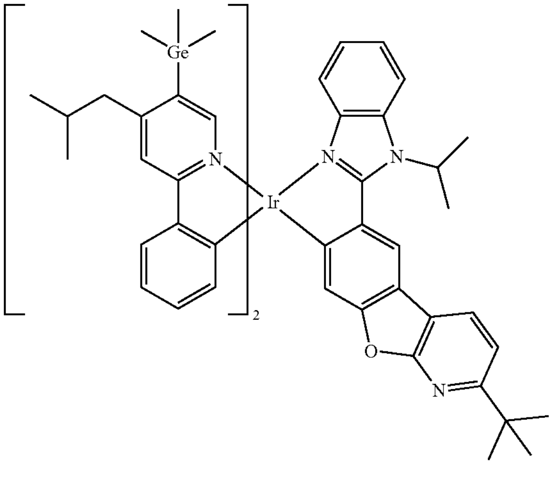

-continued
2035
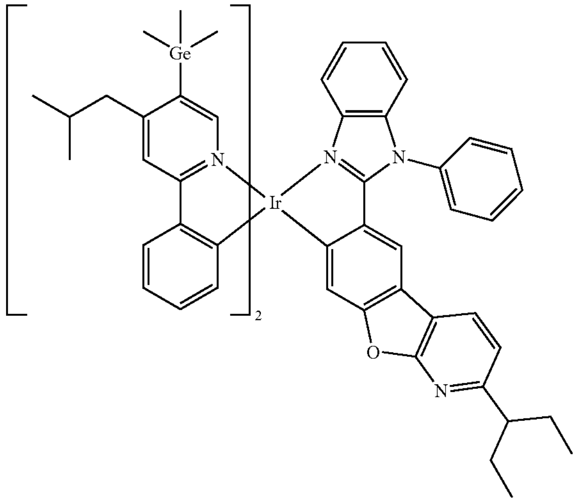
2036
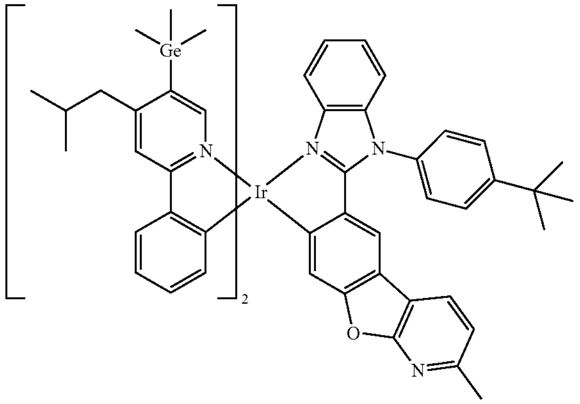
2037
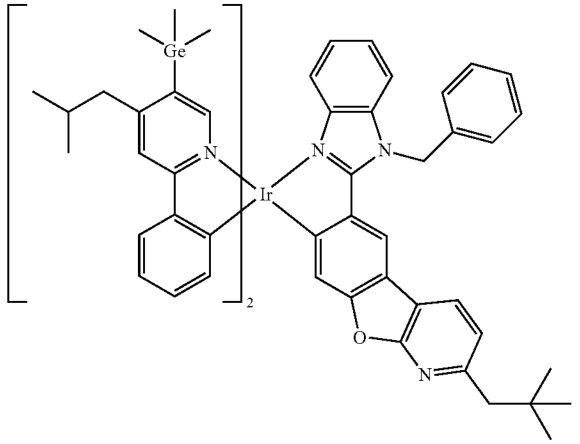
-continued
2038
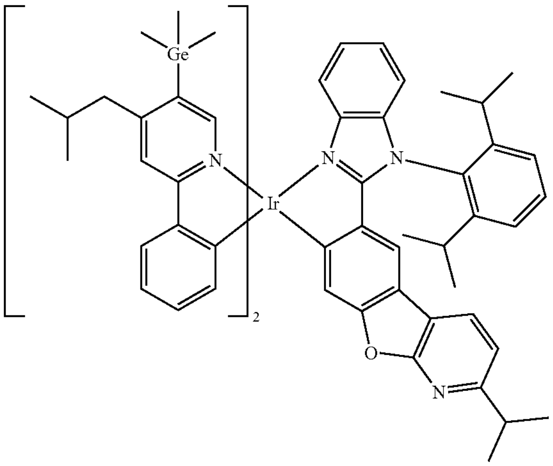
2039
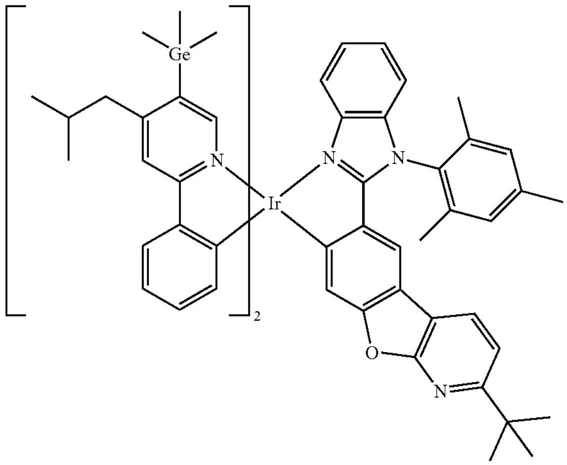
2040
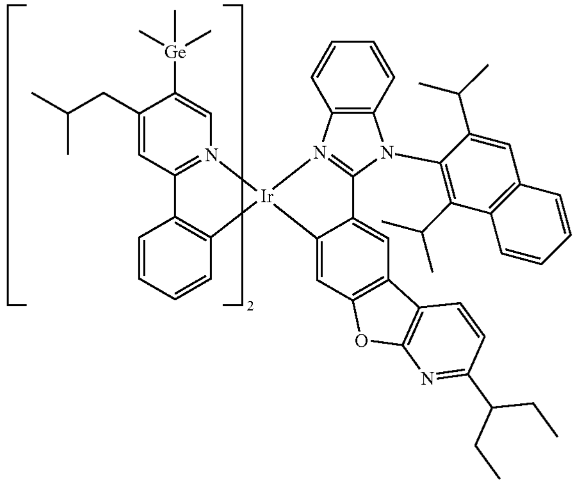

-continued
2041
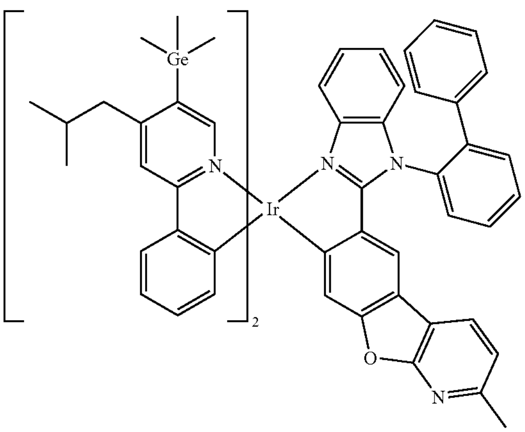
2042
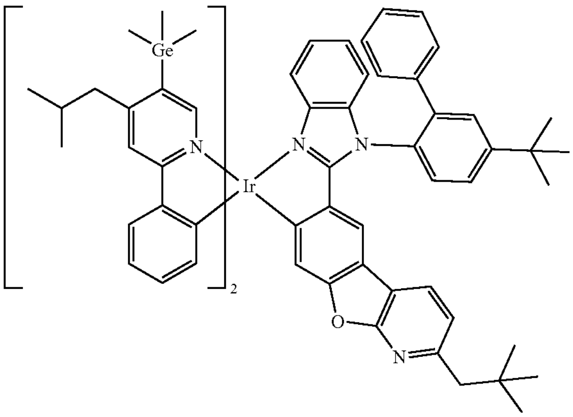
2043
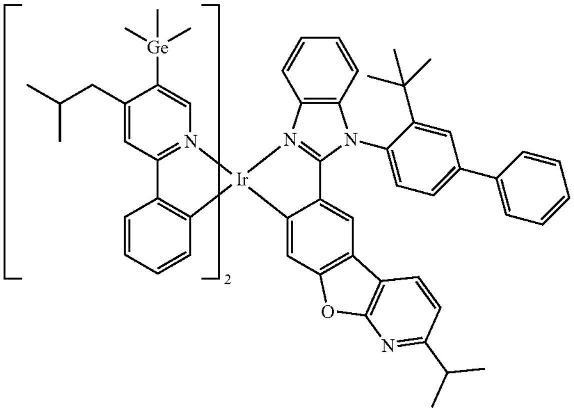
-continued
2044
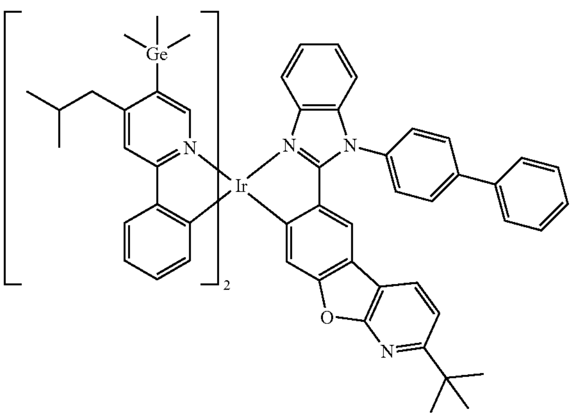
2045
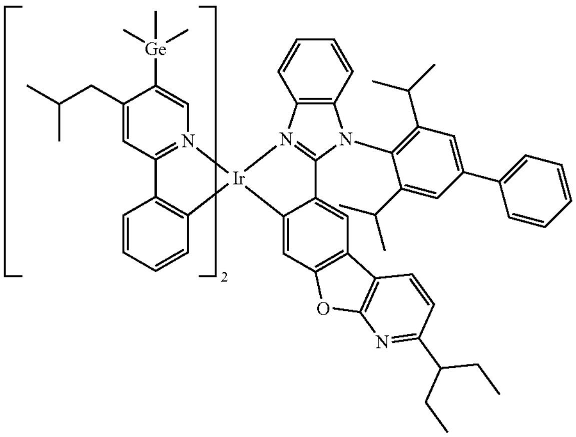
2046
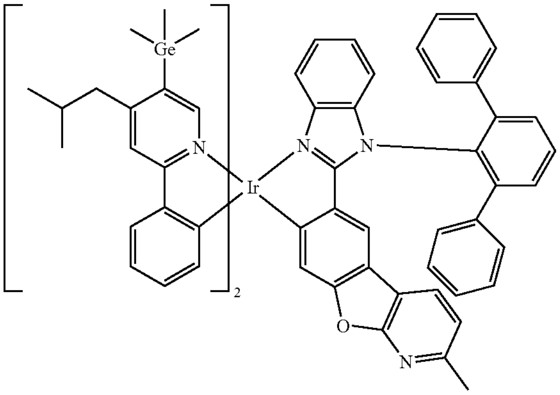

-continued
2047
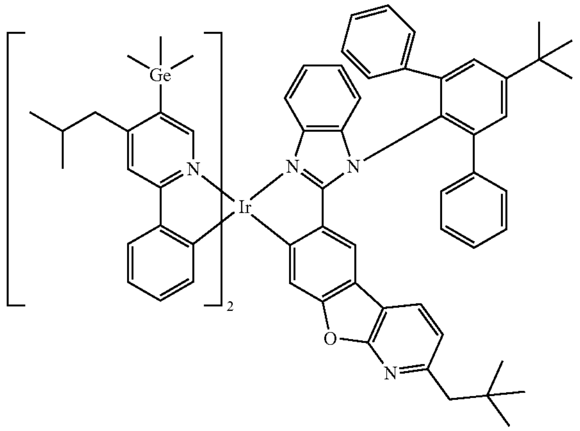
2048
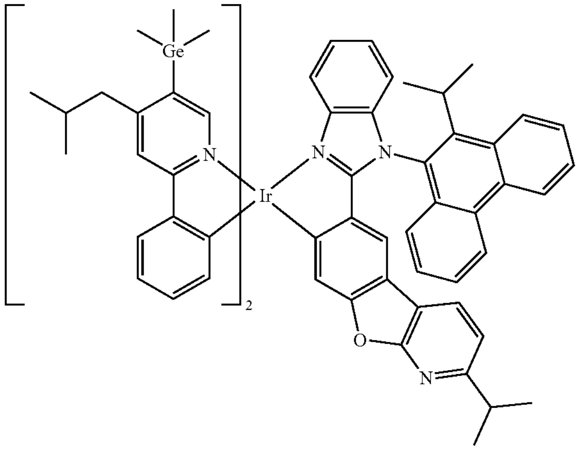
2049
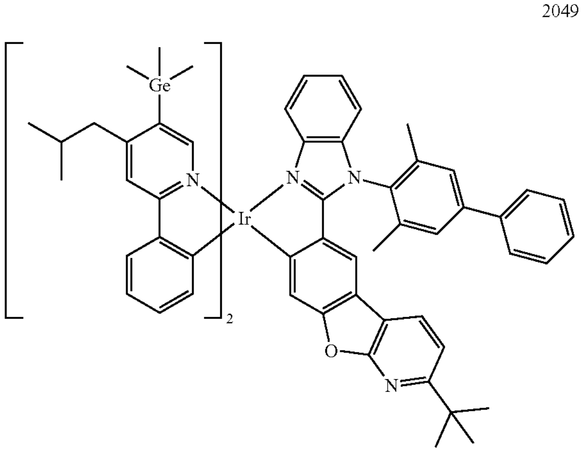
-continued
2050
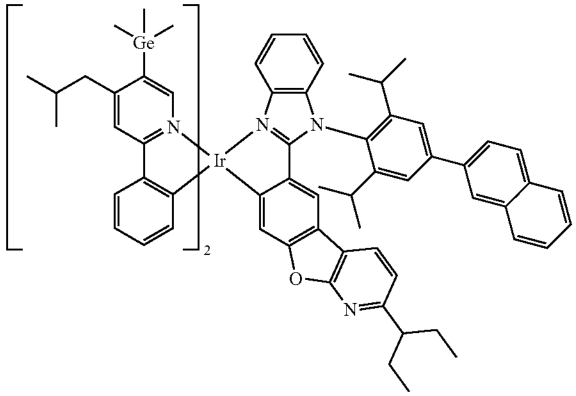
2051
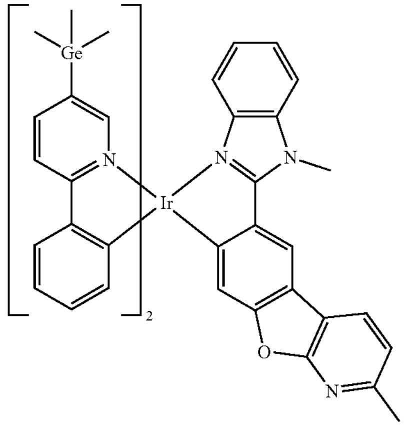
2052
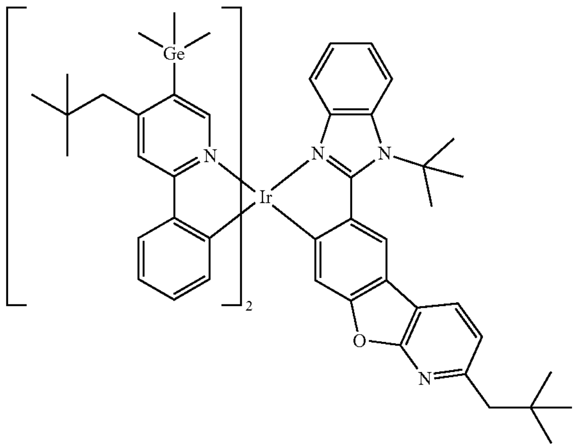

2053
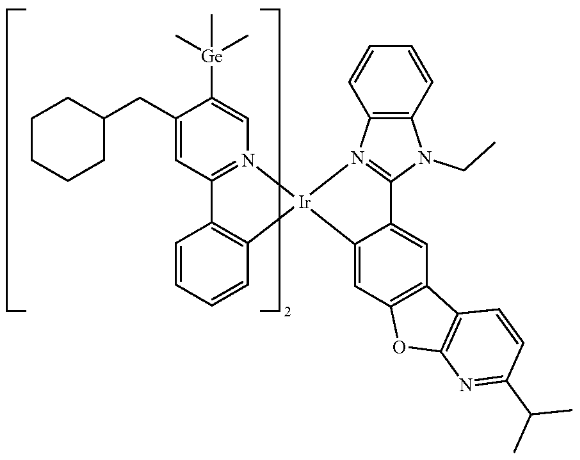
2054
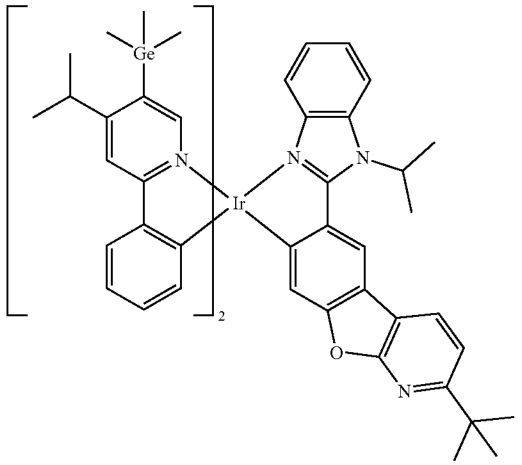
2055
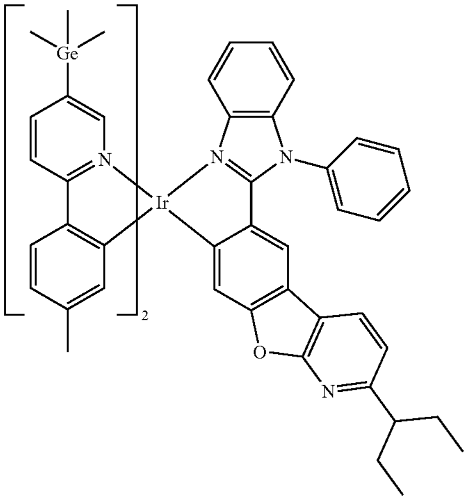
2056
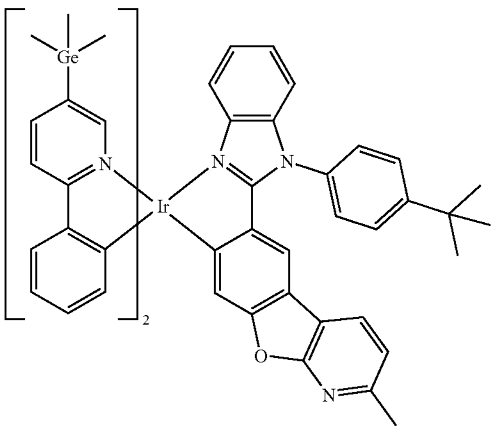
2057
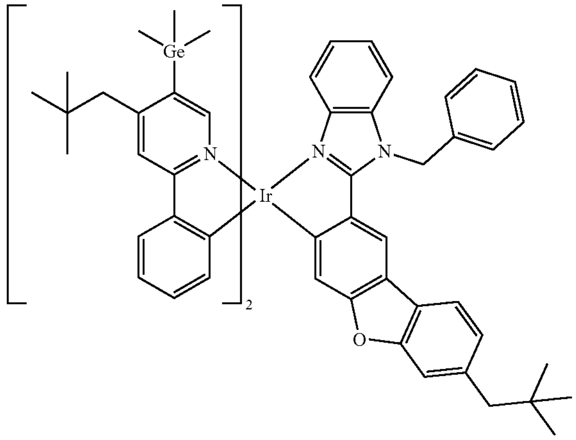
2058
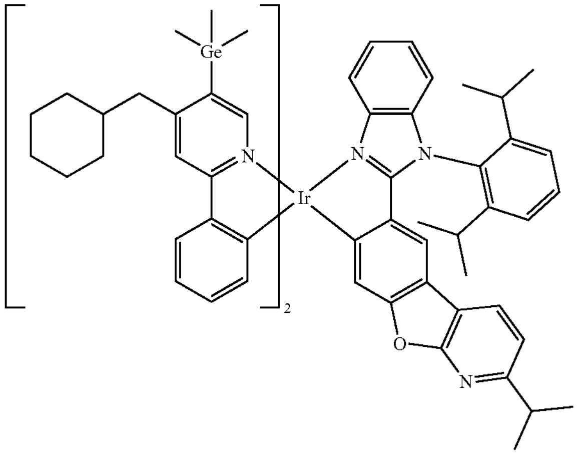

-continued
2059
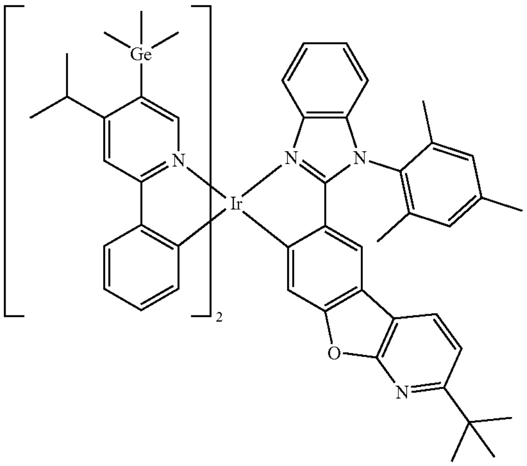
2060
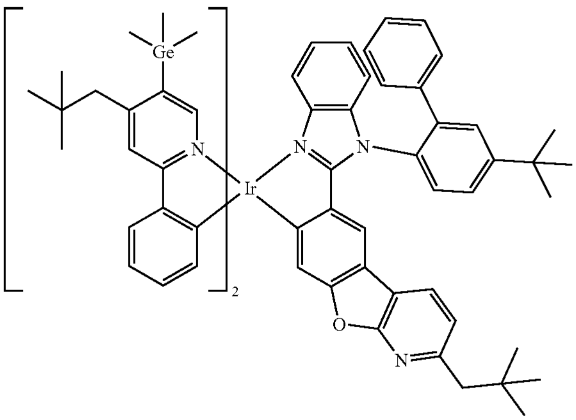
2060
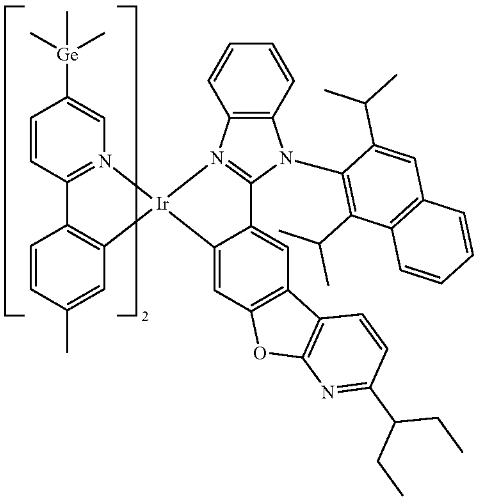
2063
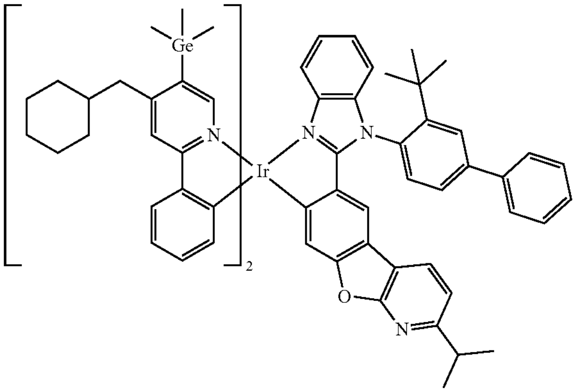
2061
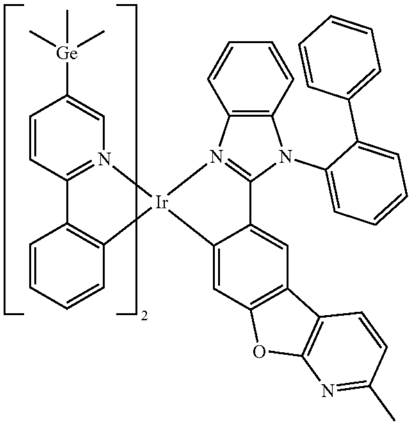
2064
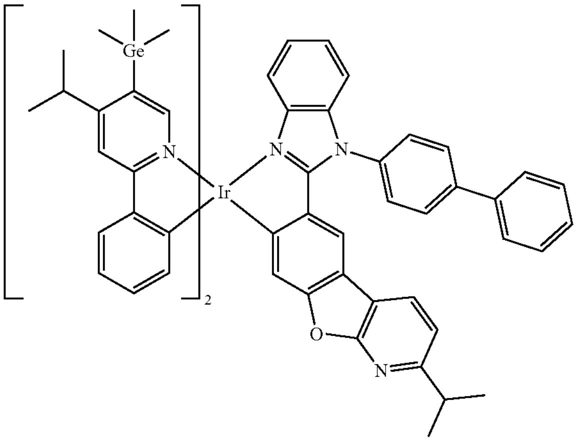

-continued
2065
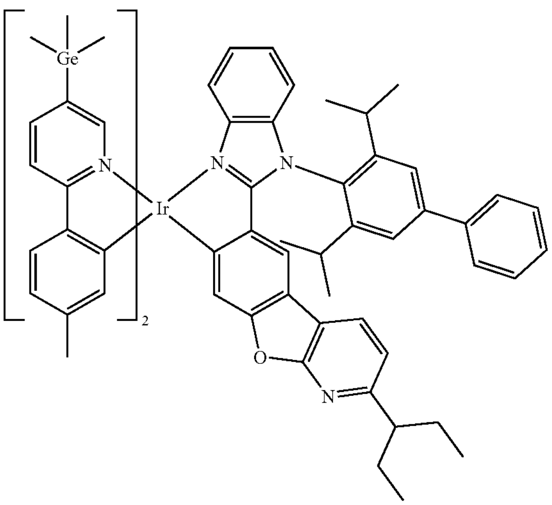
2066
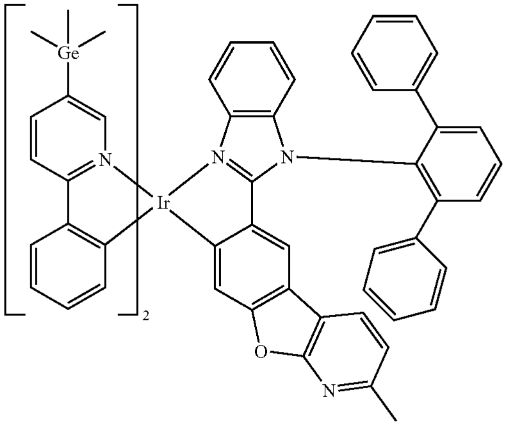
2067
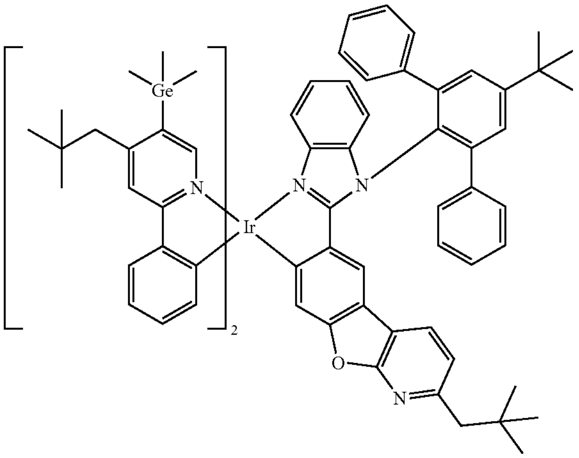
-continued
2068
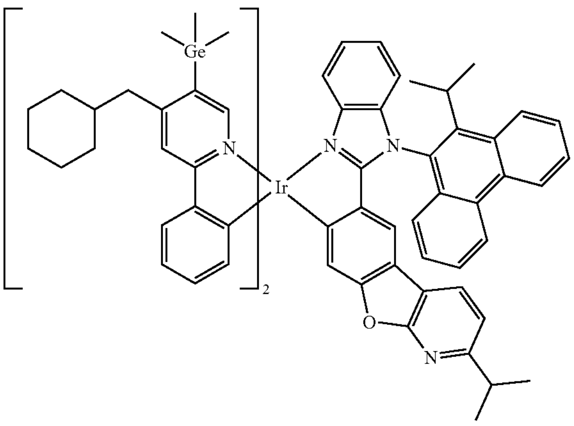
2069
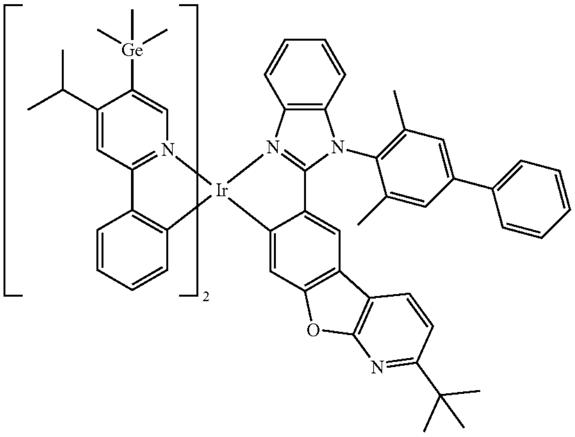
2070
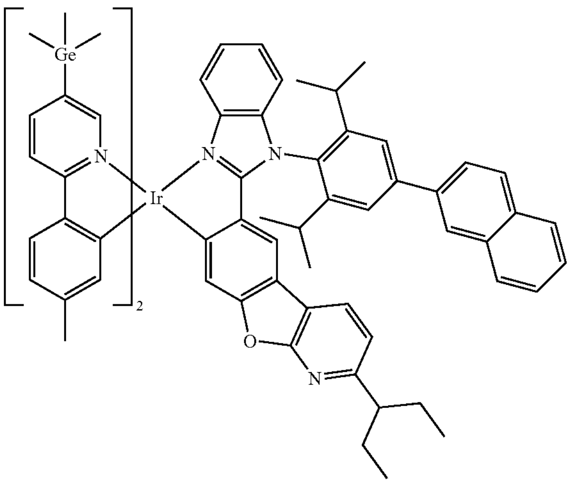

-continued
2071
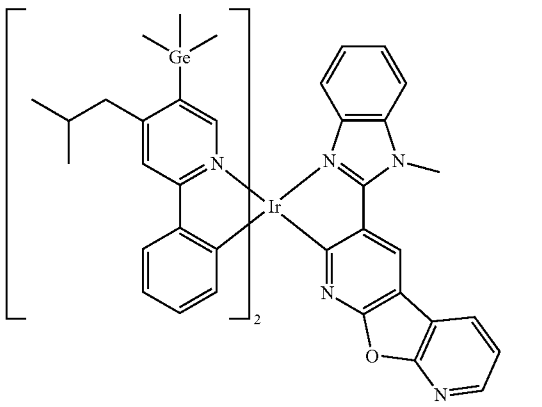
2072
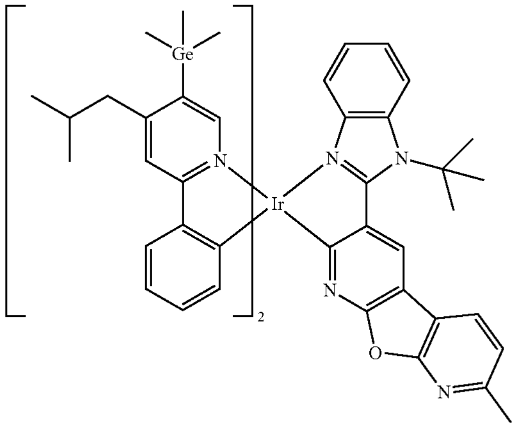
2073
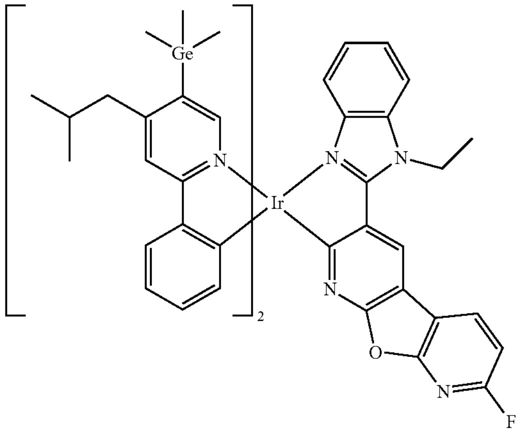
-continued
2074
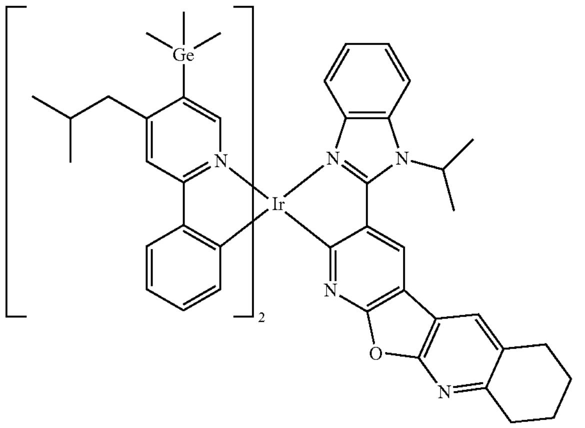
2075
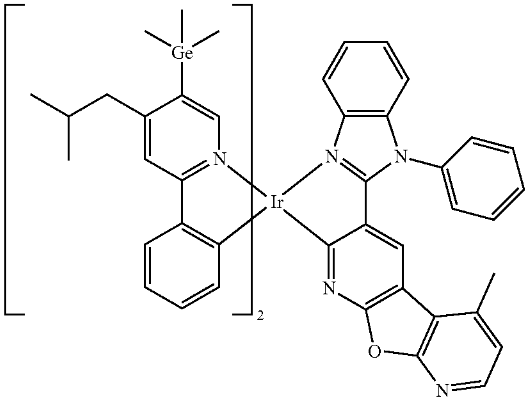
2076
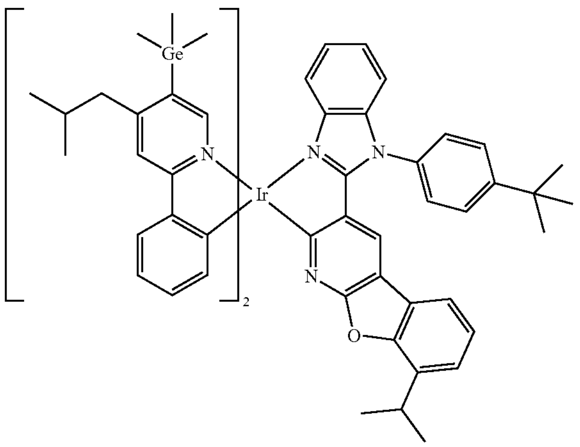

-continued
2077
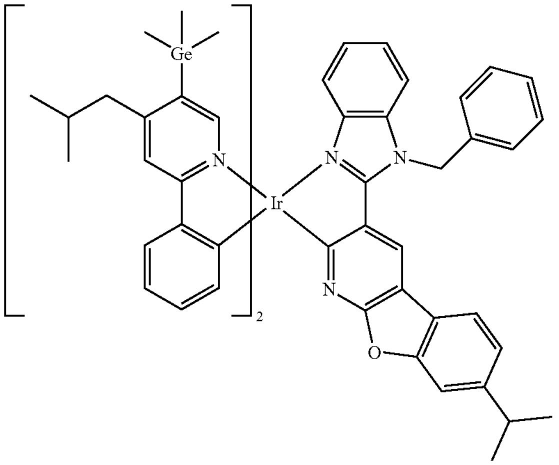
2078
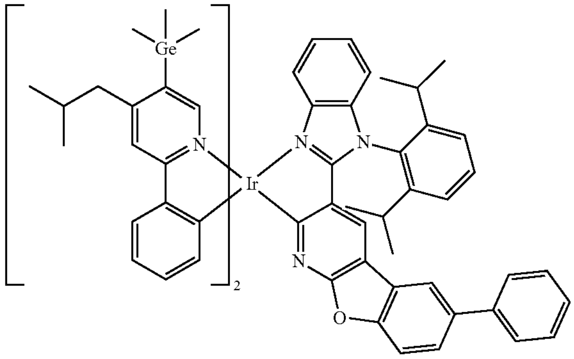
2079
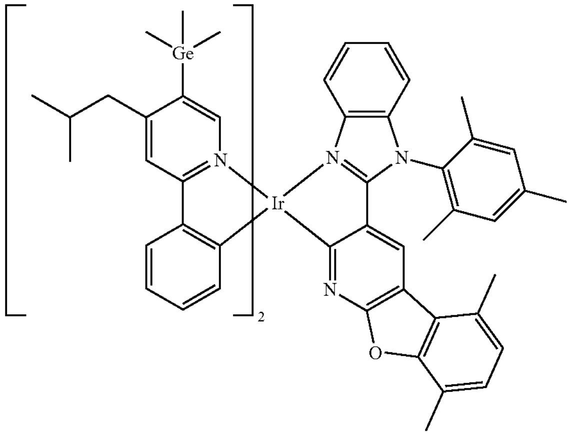
-continued
2080
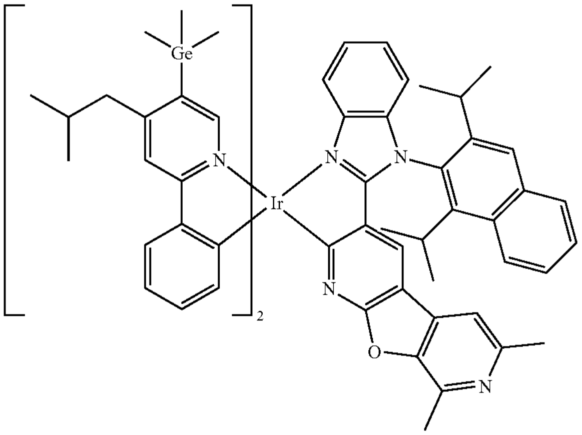
2081
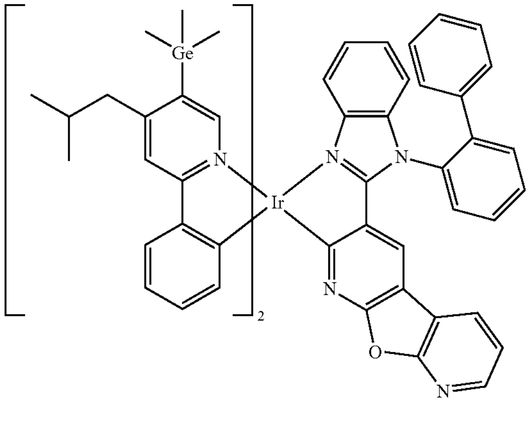
2082
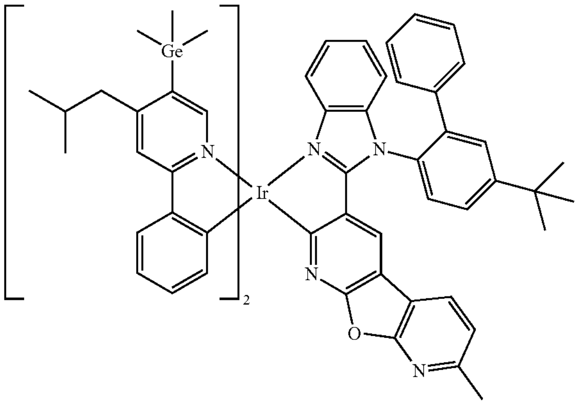

-continued
2083
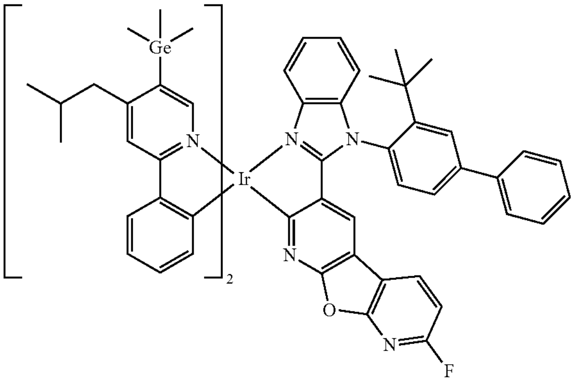
2084
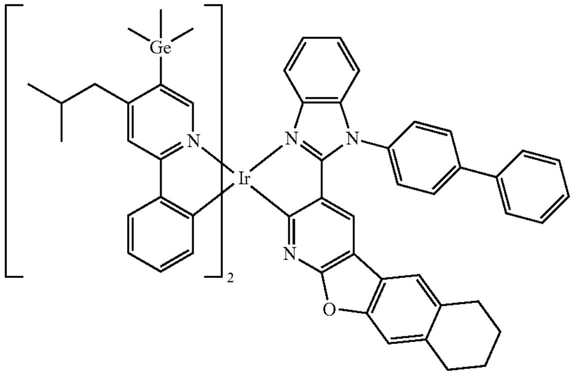
2085
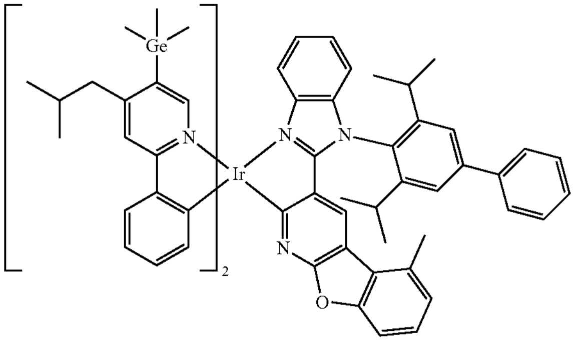
2086
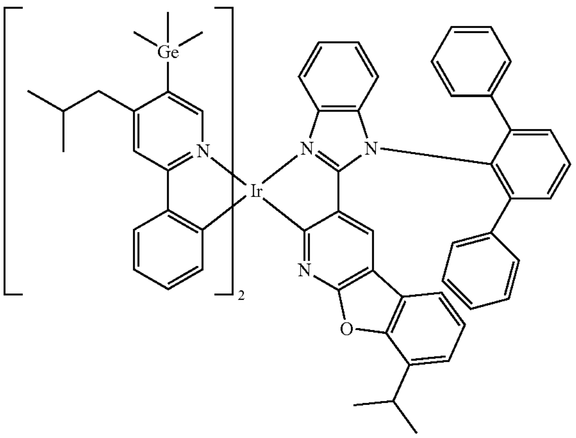
-continued
2087
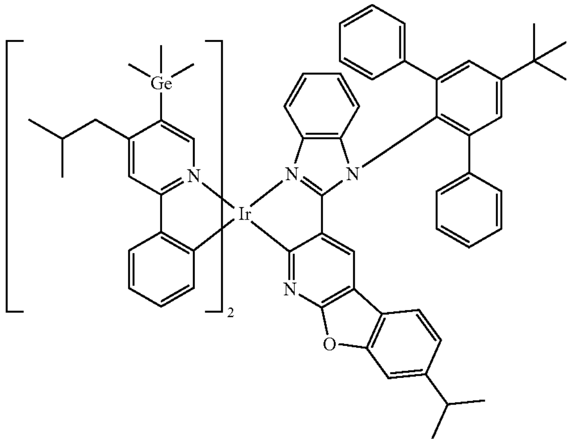
2088
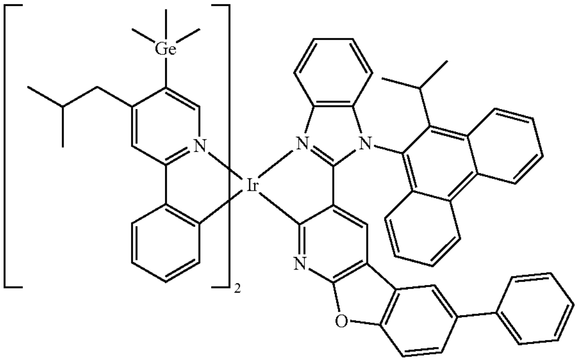
2089
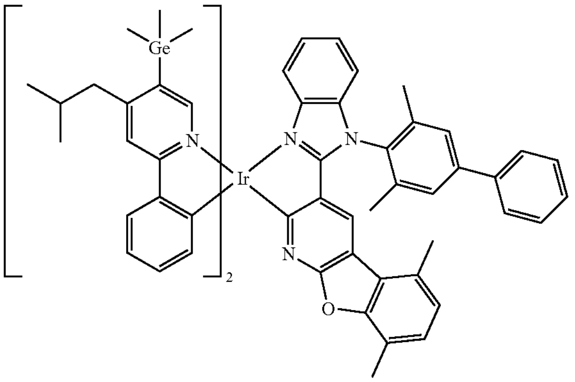
2090
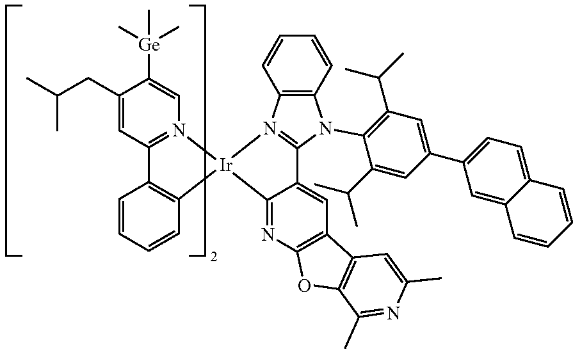

-continued
2091
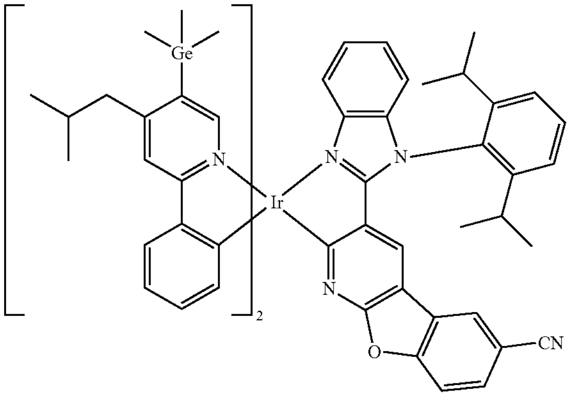
2092
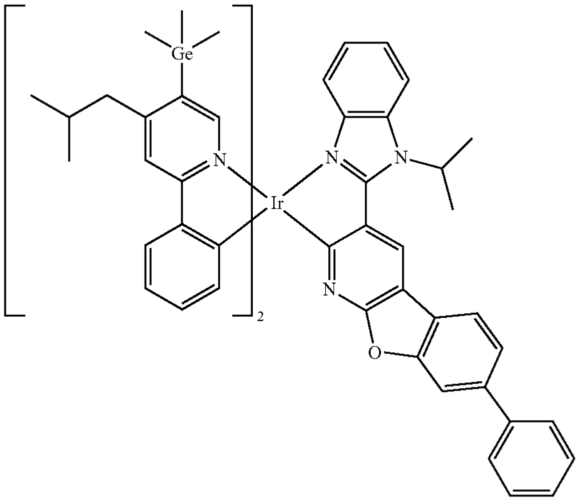
2093
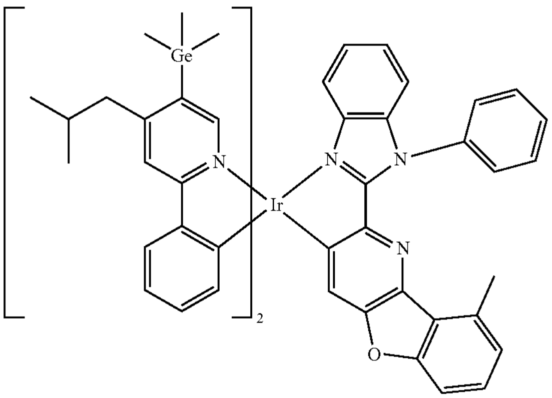
-continued
2094
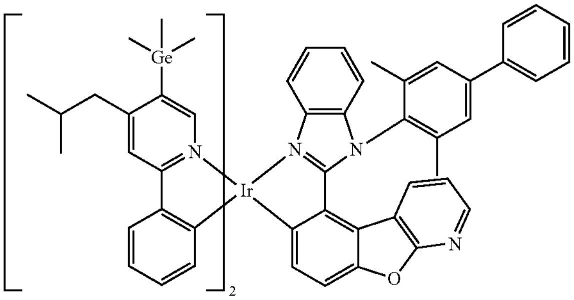
2095
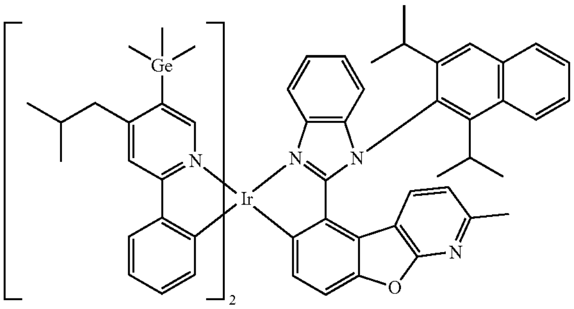
2096
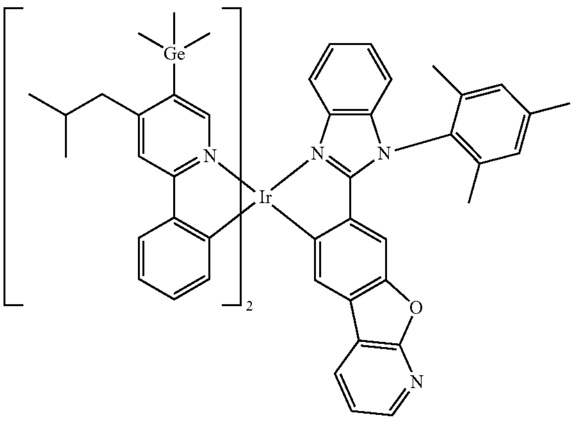
2097
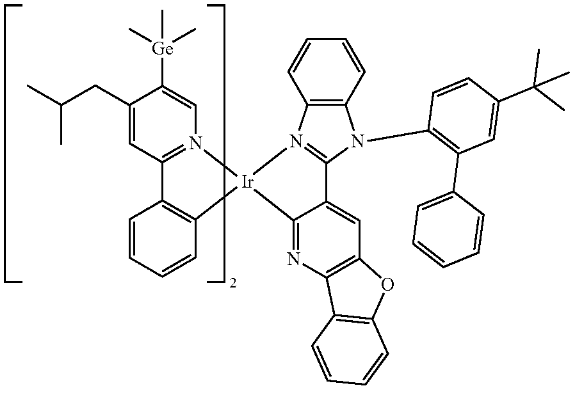

2098
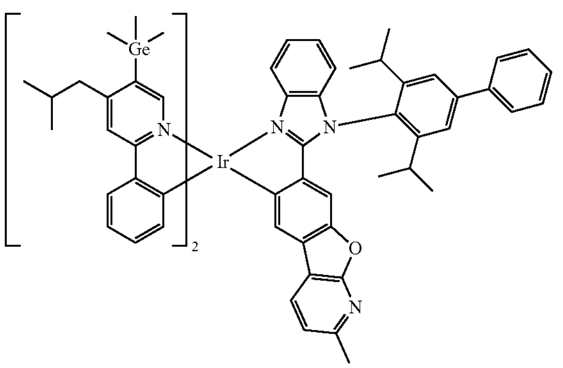
2099
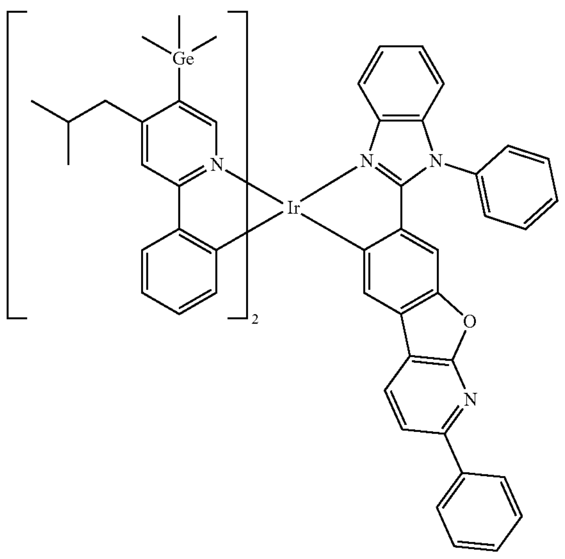
2100
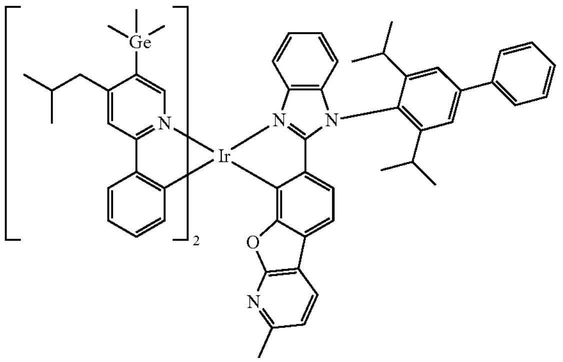
2101
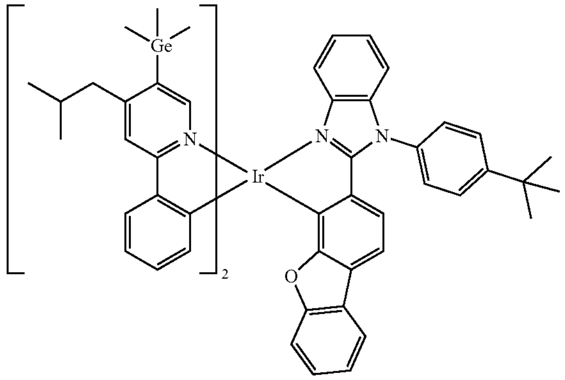
2102
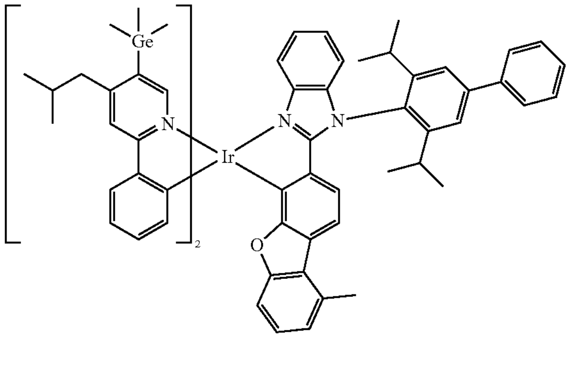
2103
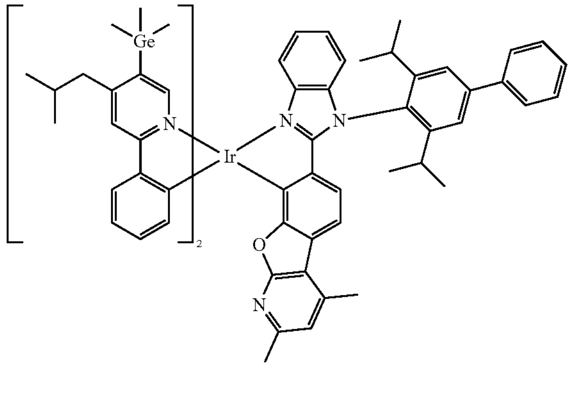

-continued
2104
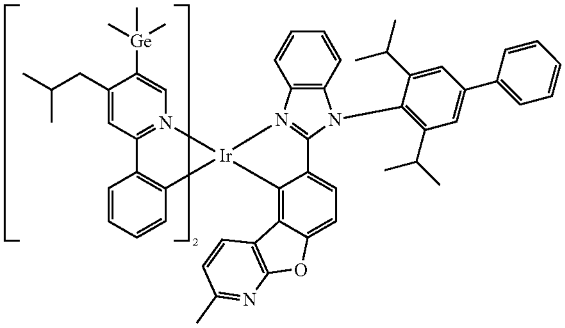
2105
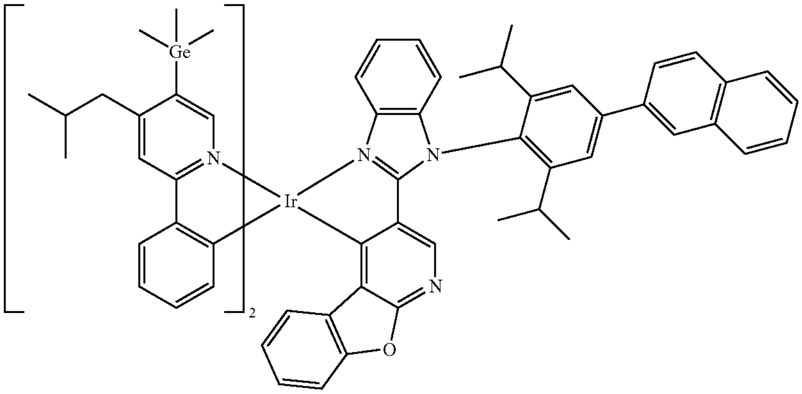
2106
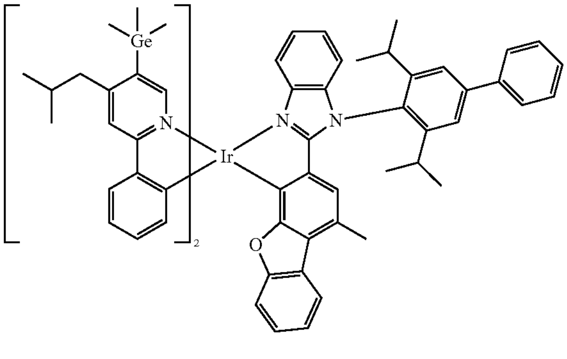
2107
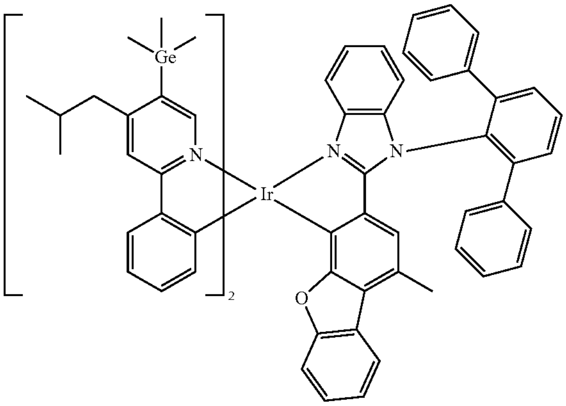
2108
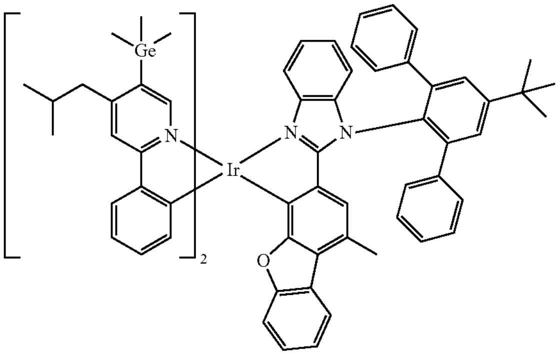
2109
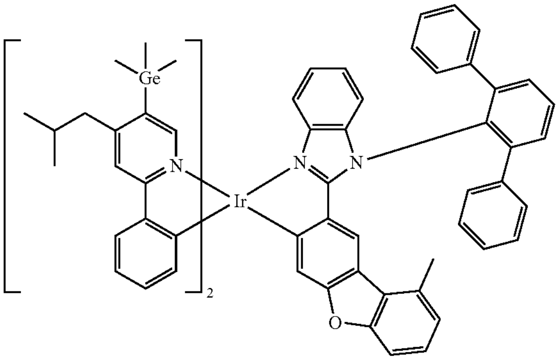

-continued
2110
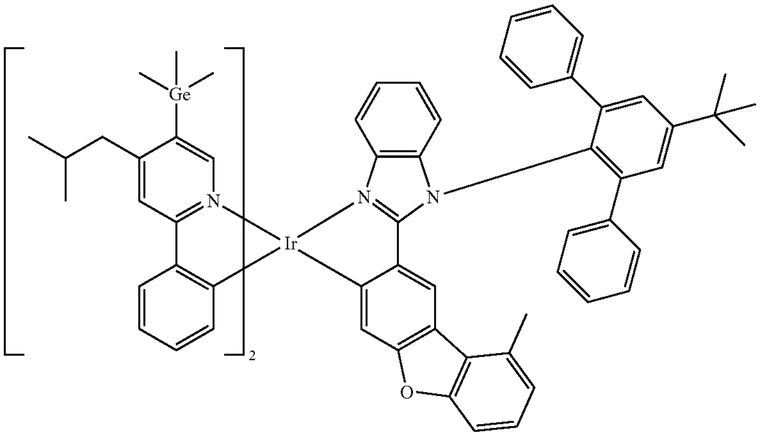
2111
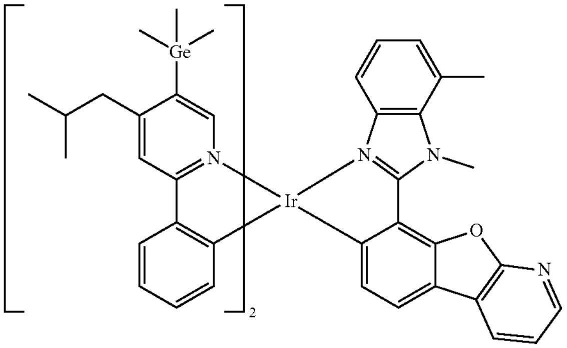
2112
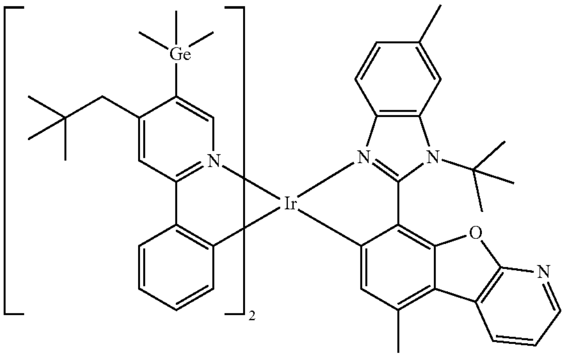
2113
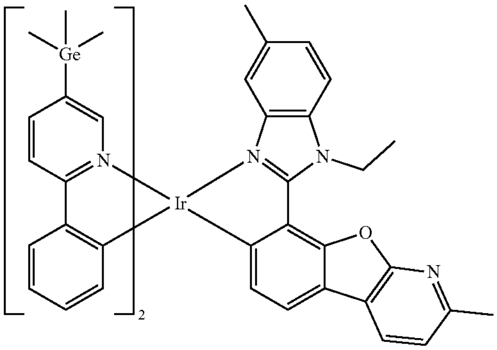
2114
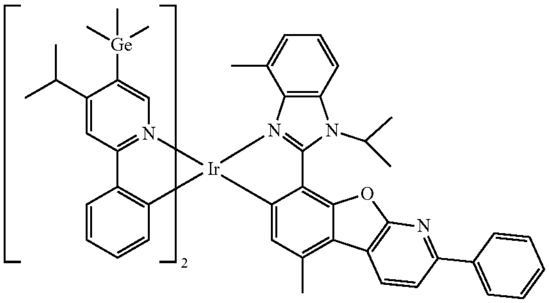
2115
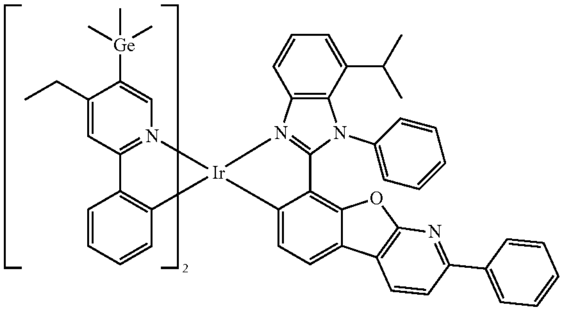

-continued
2116
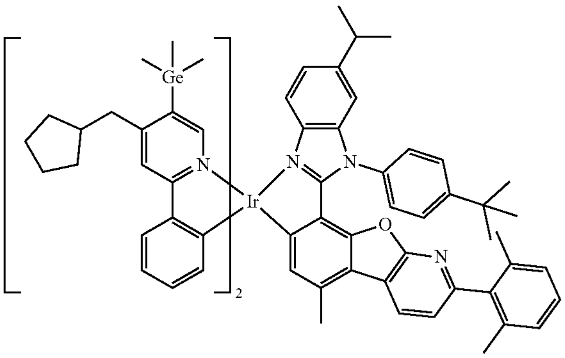
2117
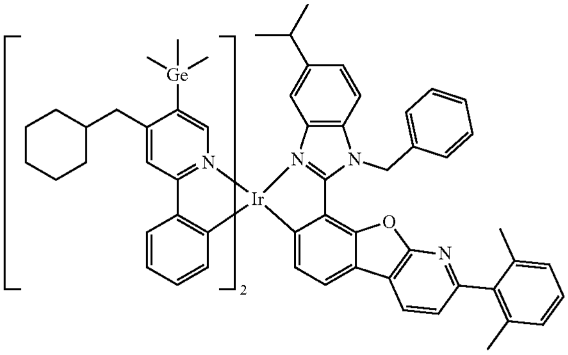
2118
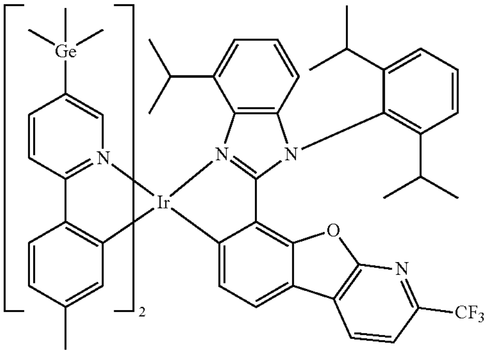
2119
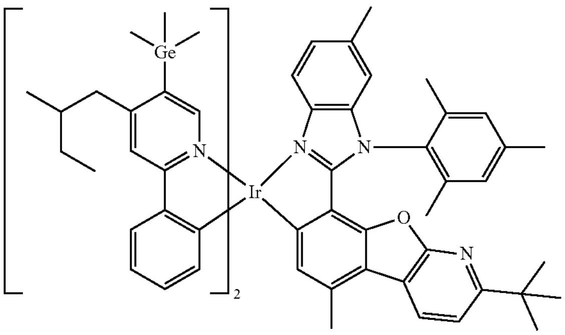
2120
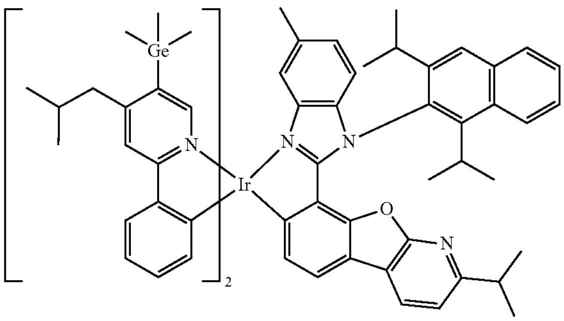
2121
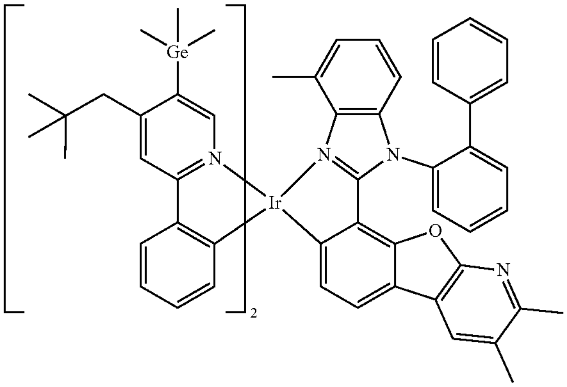
2122
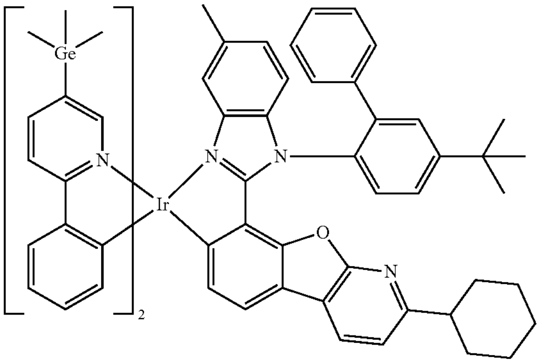
2123
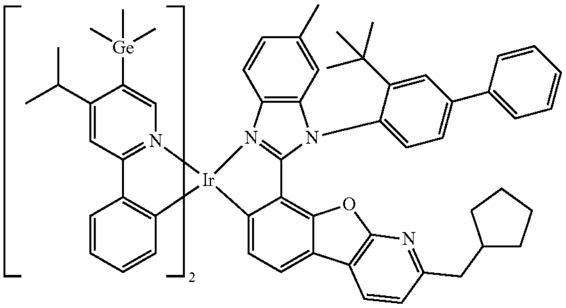

-continued
2124
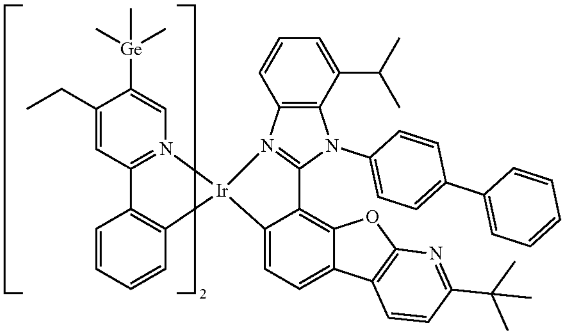
2125
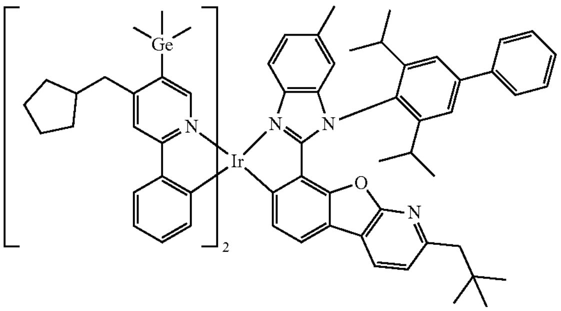
2126
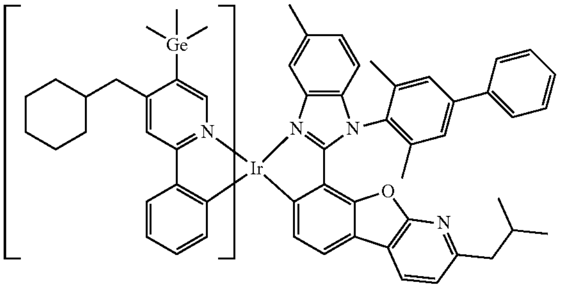
2127
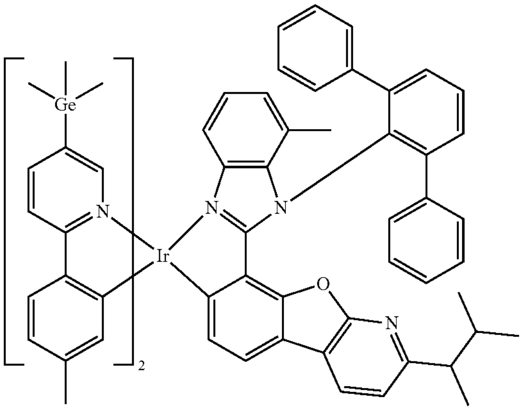
-continued
2128
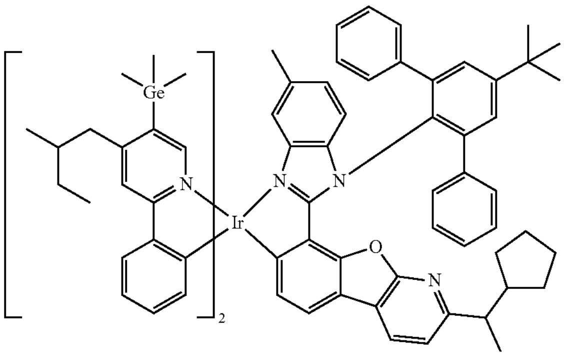
2129
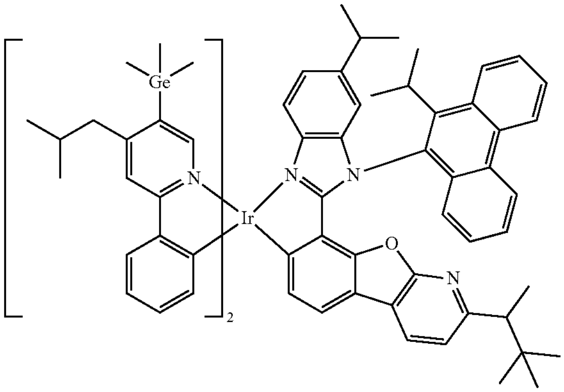
2130
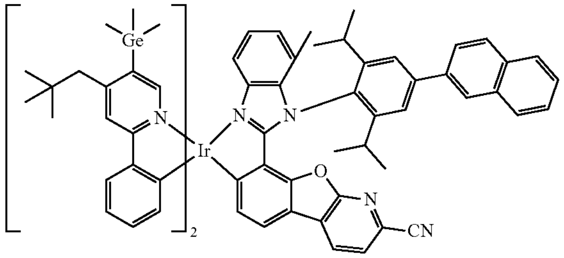
2131
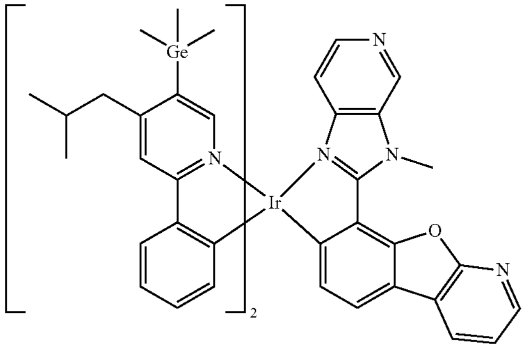

-continued
2132
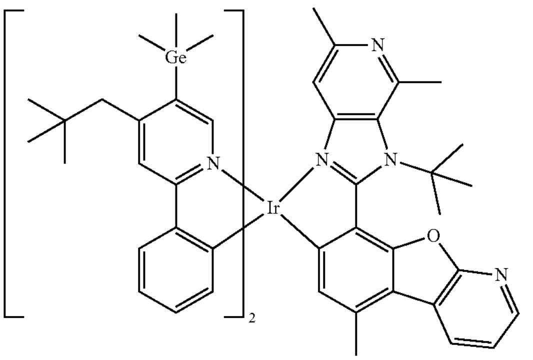
2133
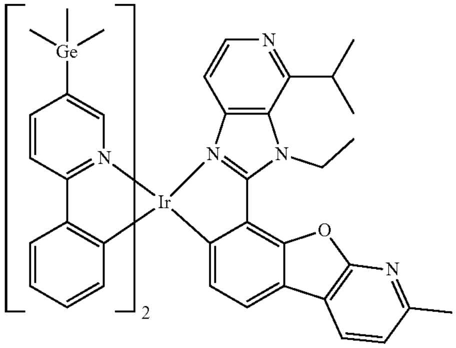
2134
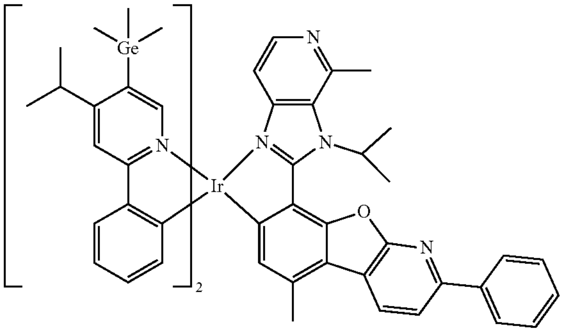
2135
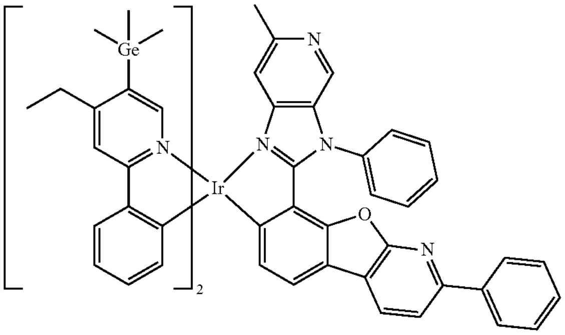
-continued
2136
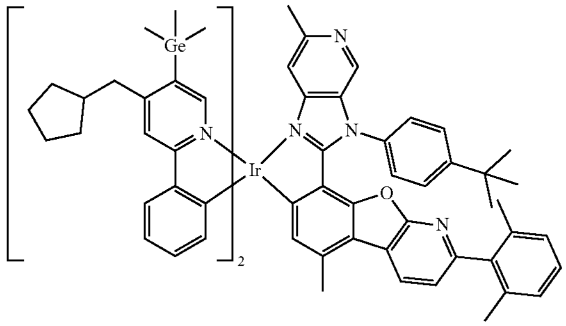
2137
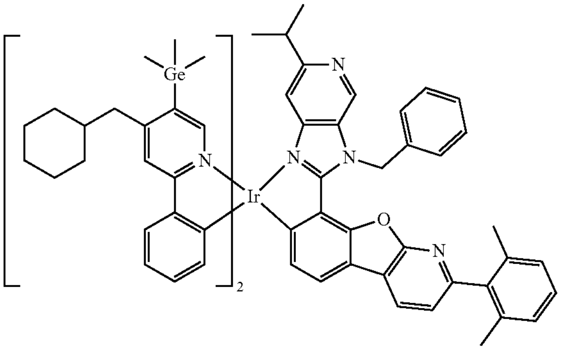
2138
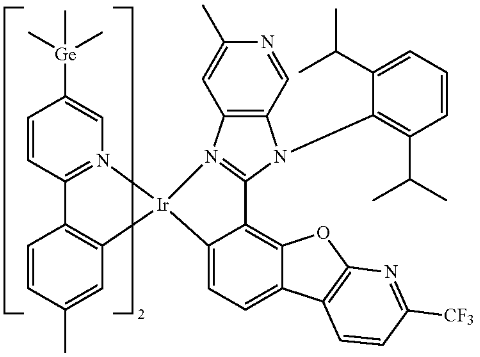
2139
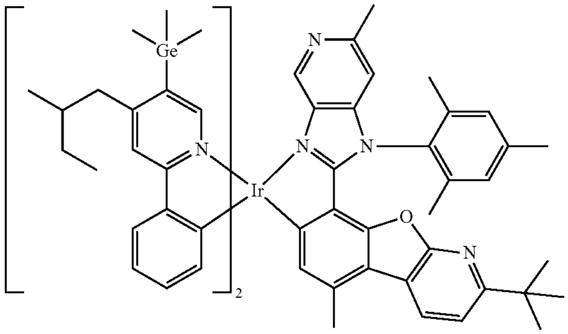

-continued
2140
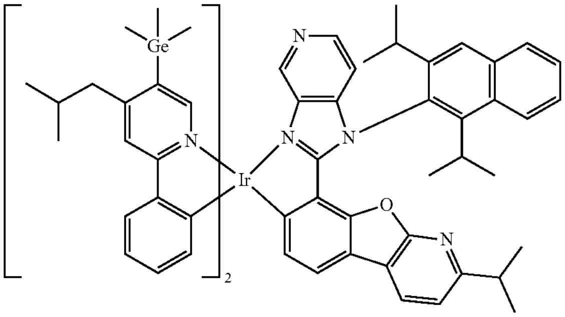
2141
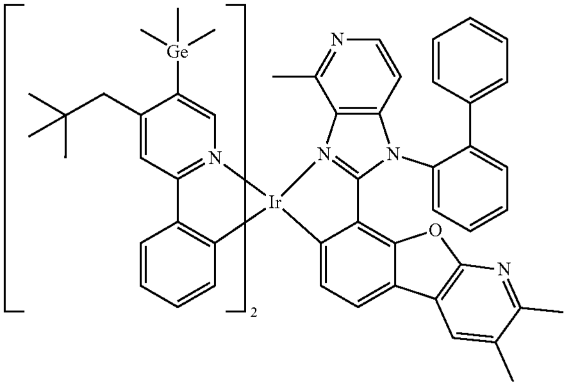
2142
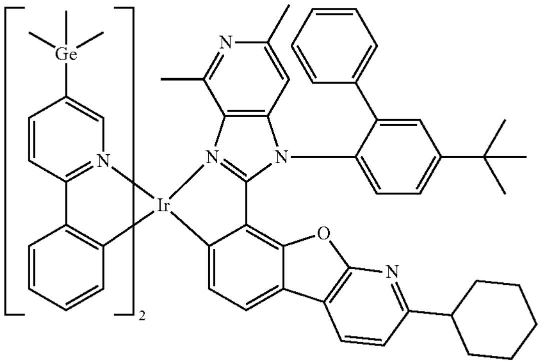
2143
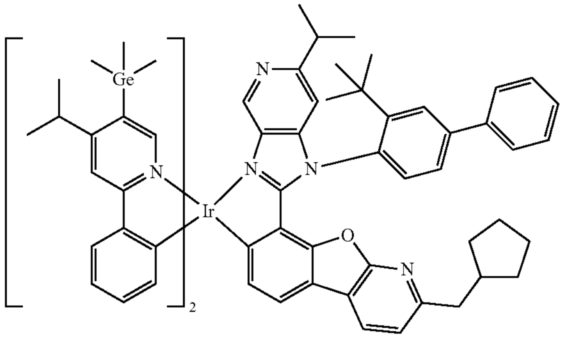
-continued
2144
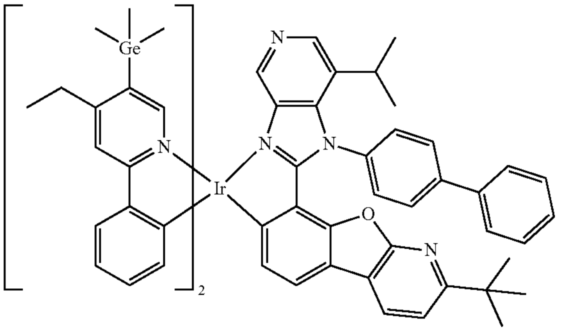
2145
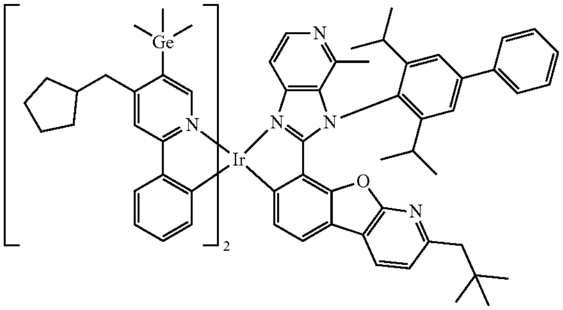
2146
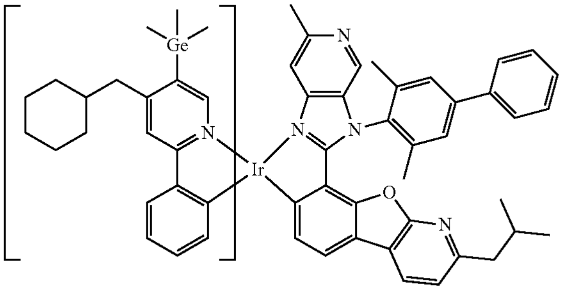
2147
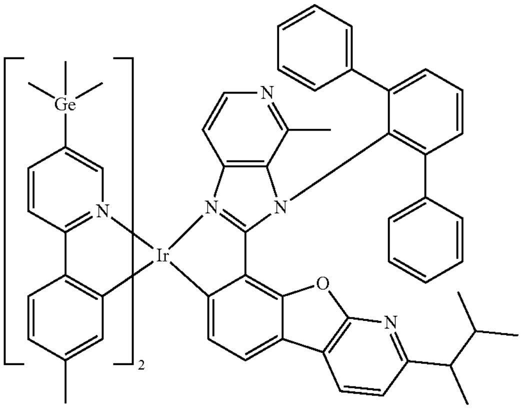

-continued
2148
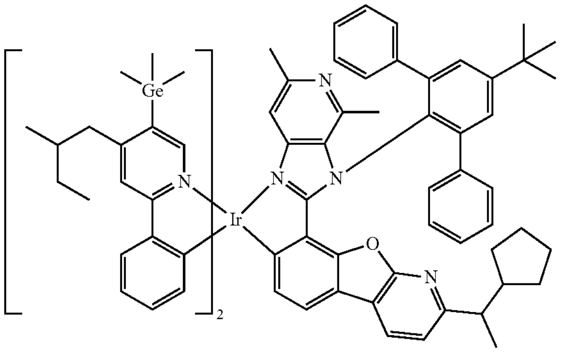
2149
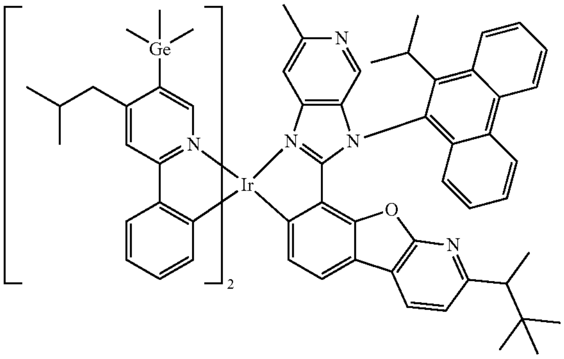
2150
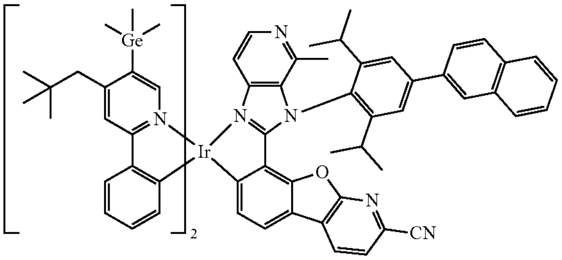
2151
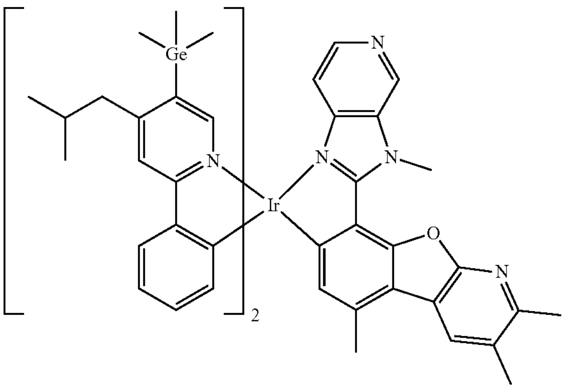
-continued
2152
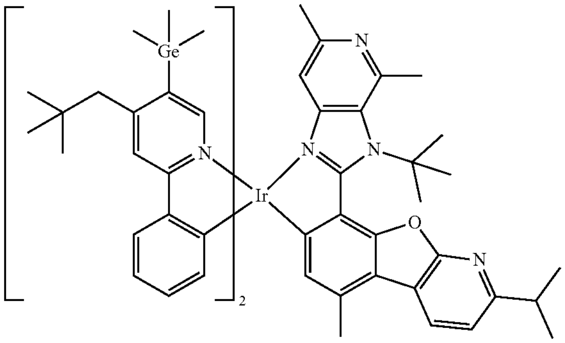
2153
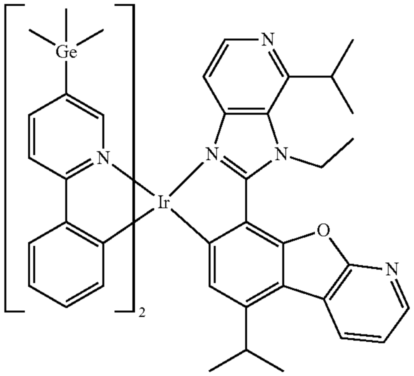
2154
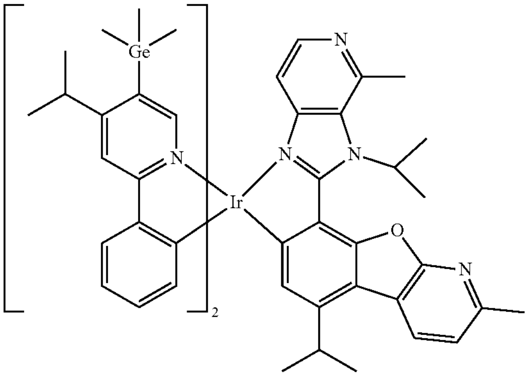
2155
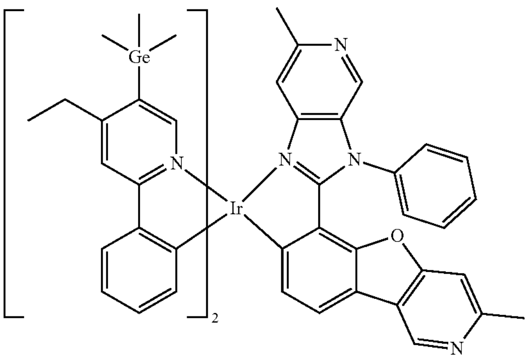

-continued
2156
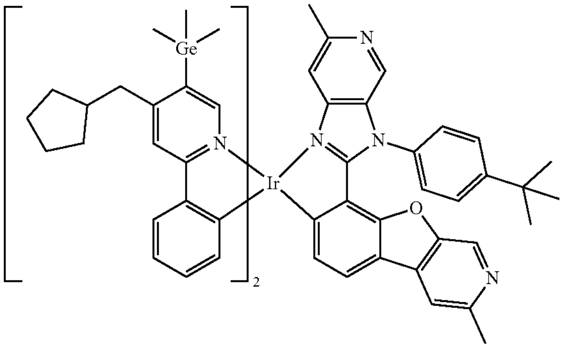
2157
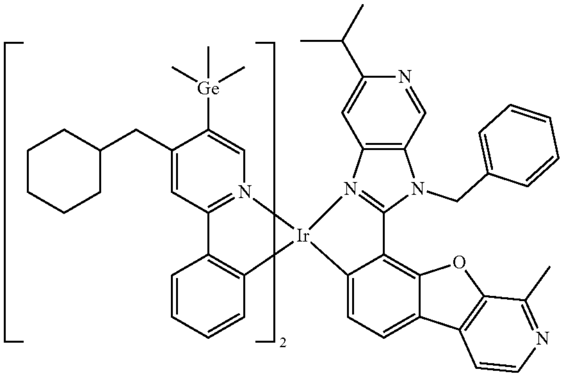
2158
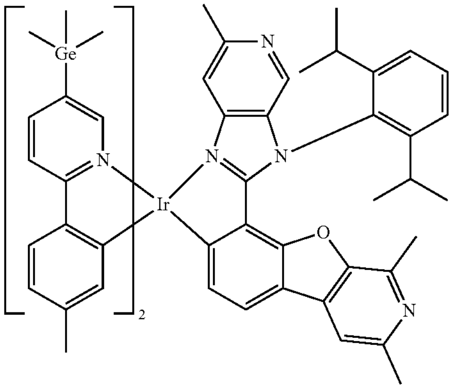
2159
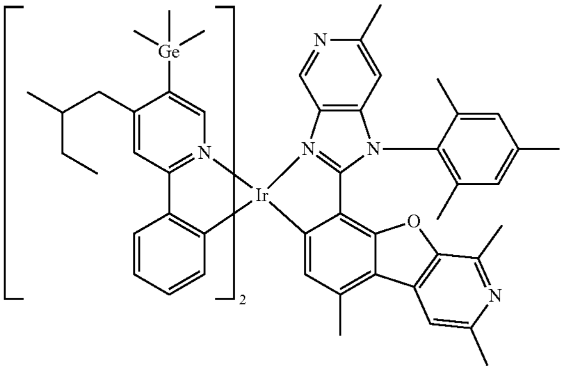
-continued
2160
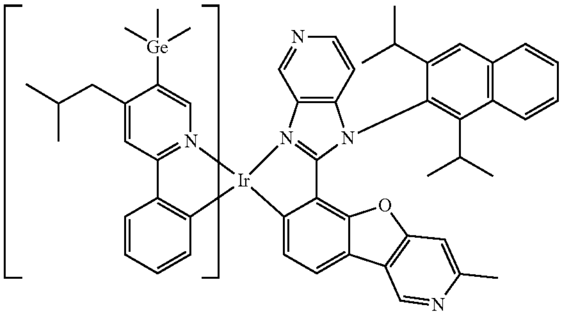
2161
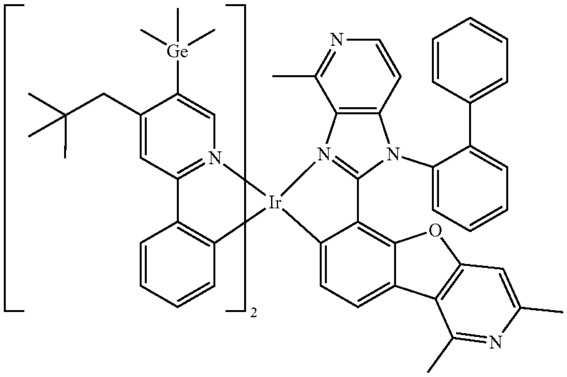
2162
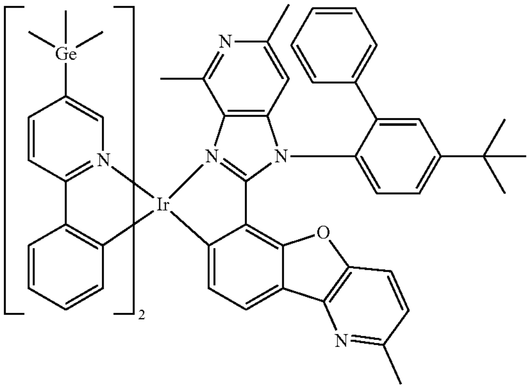
2163
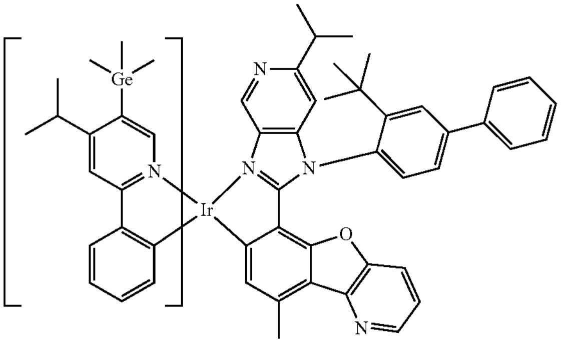

-continued
2164
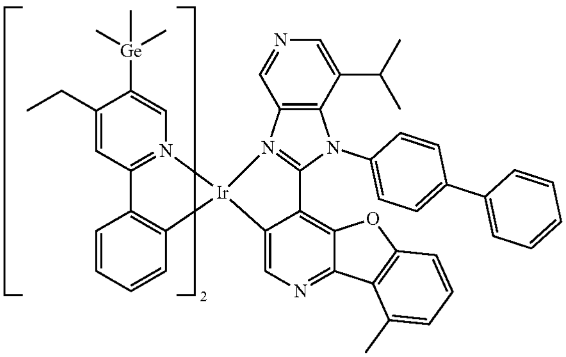
2165
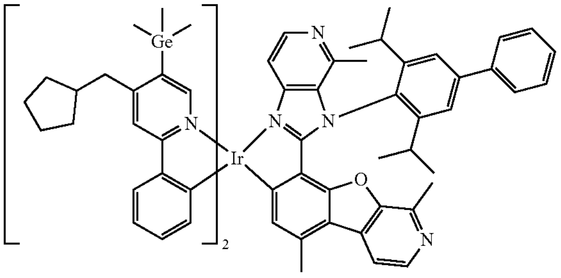
2166
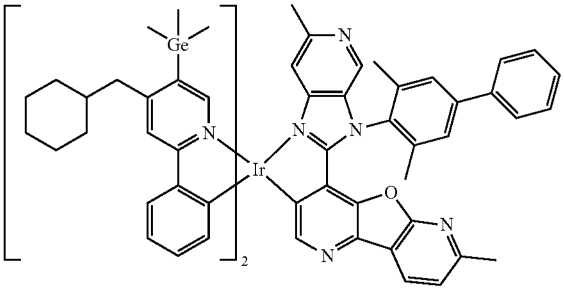
2167
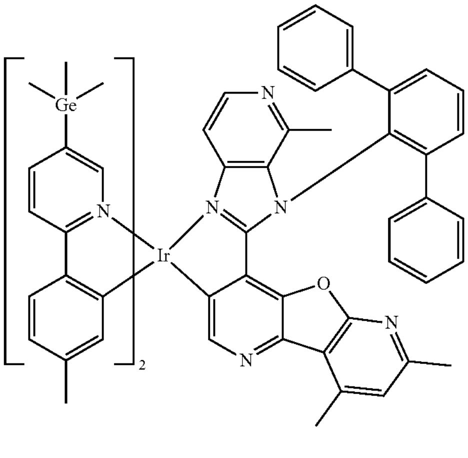
-continued
2168
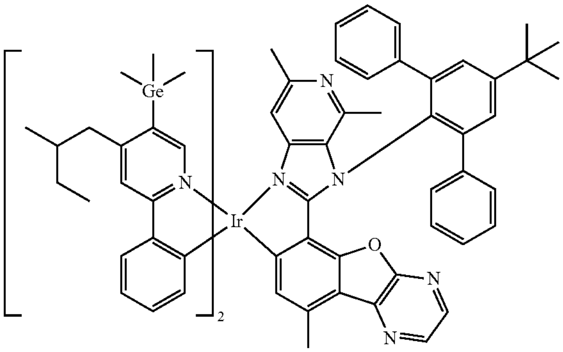
2169
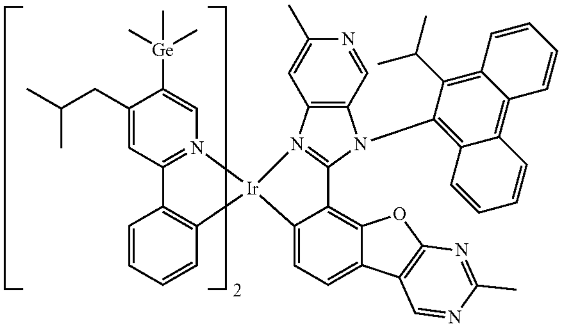
2170
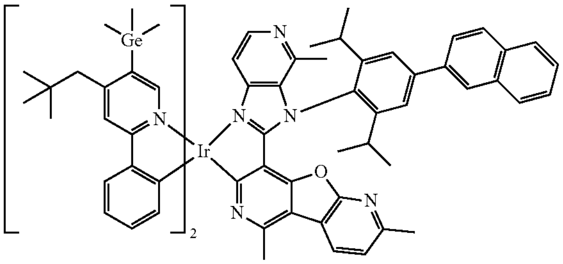
2171
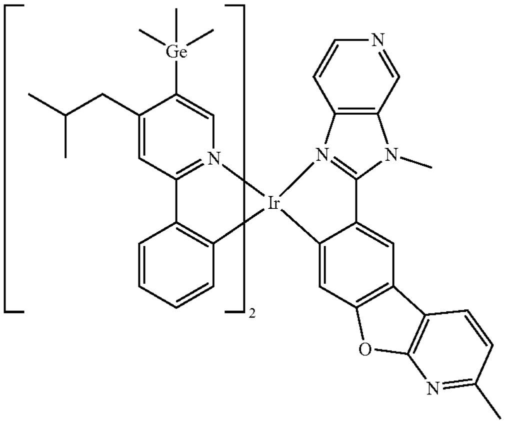

-continued
2172
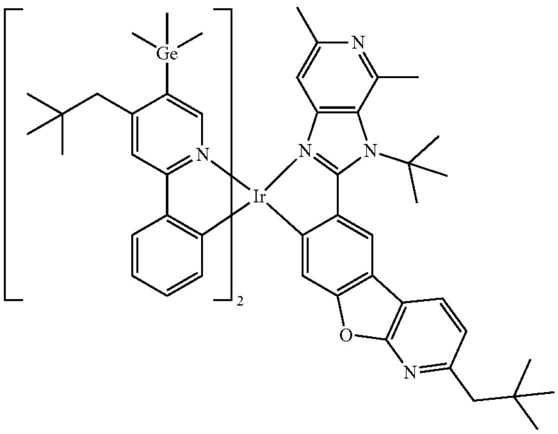
2173
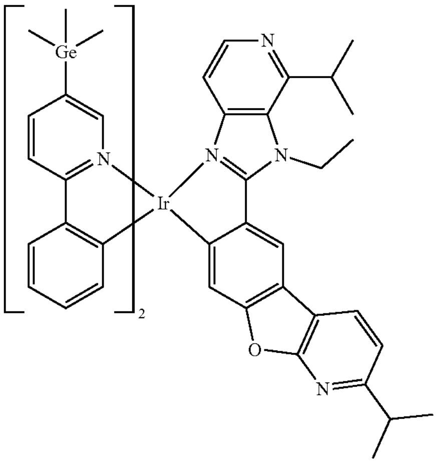
2174
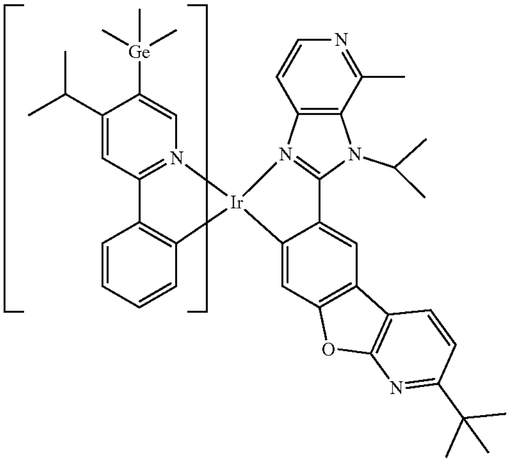
-continued
2175
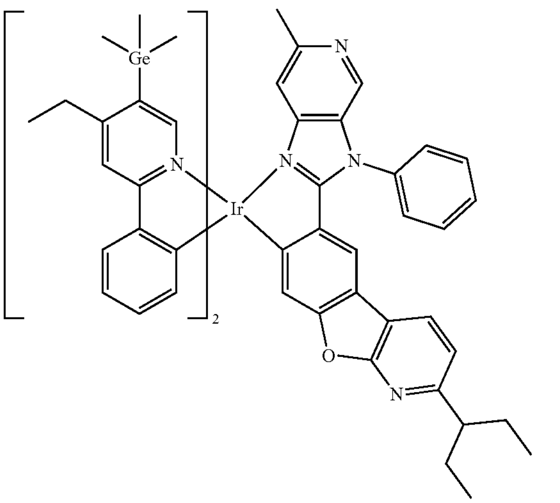
2176
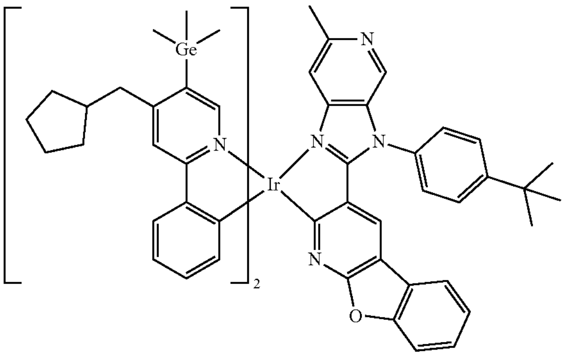
2177
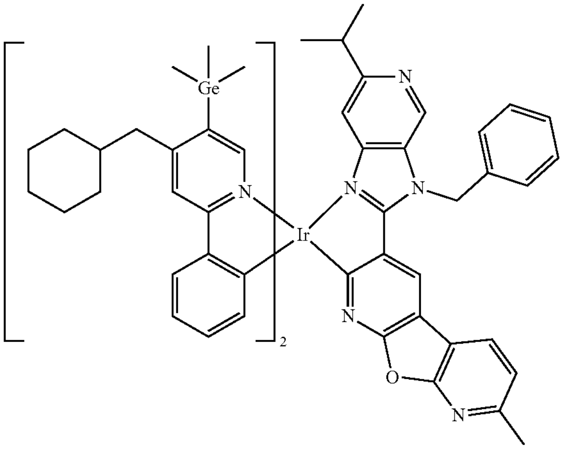

-continued
2178
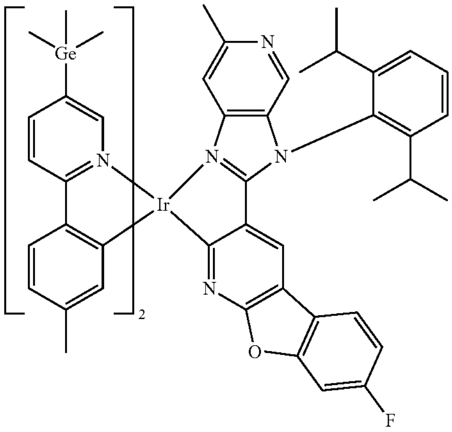
2179
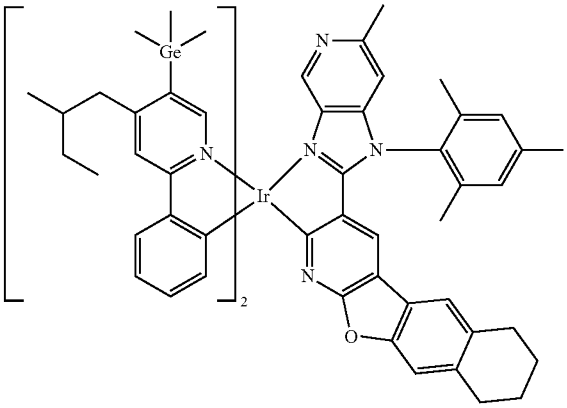
2180
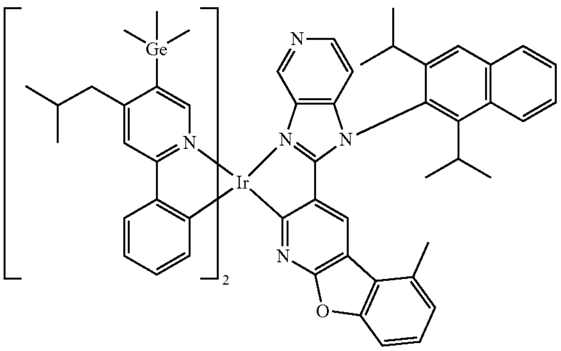
-continued
2181
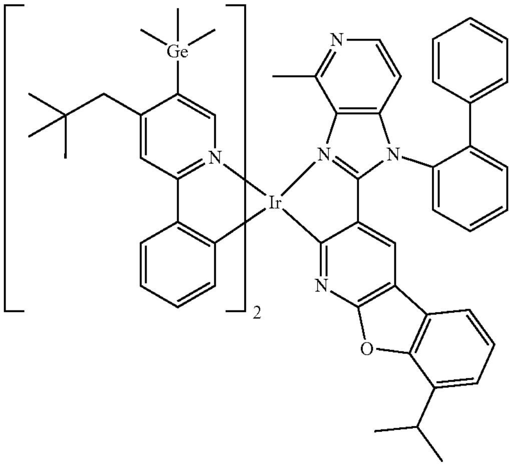
2182
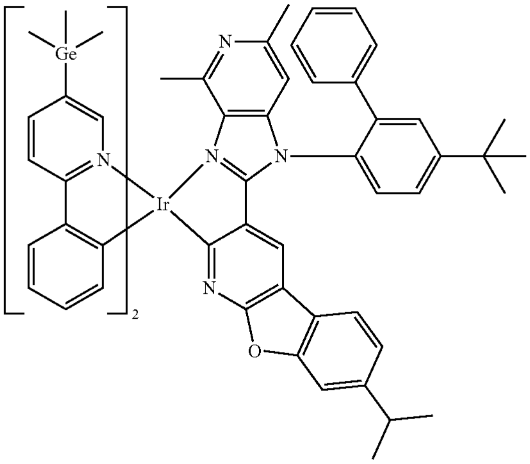
2183
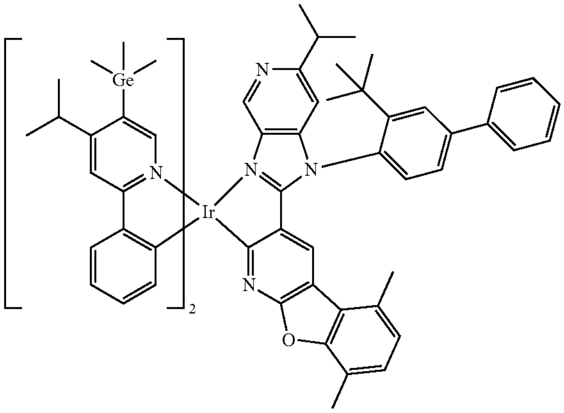

-continued
2184
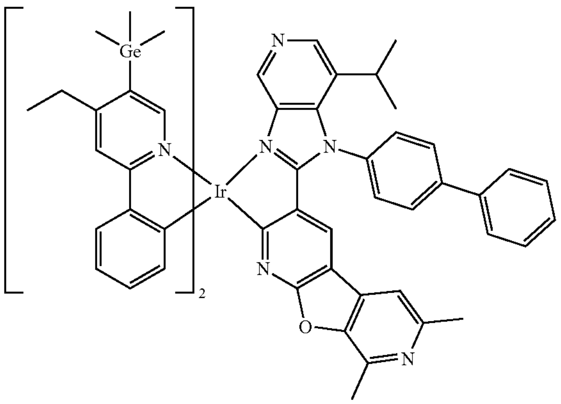
2185
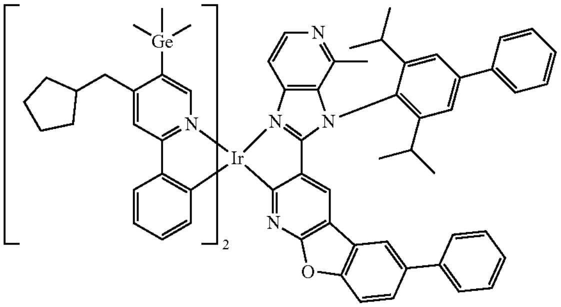
2186
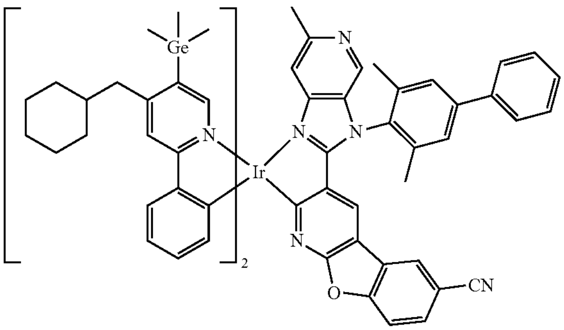
2187
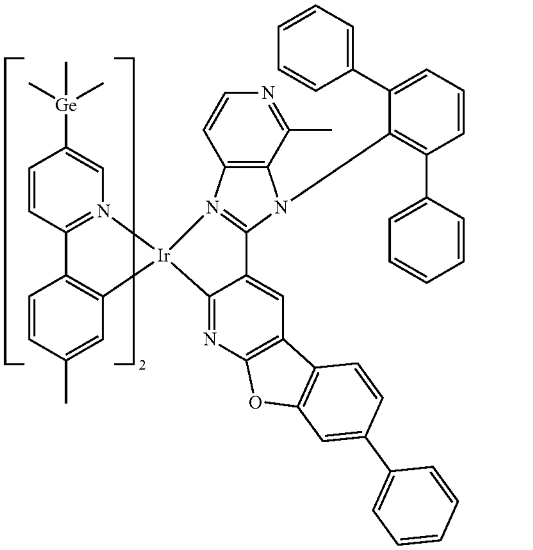
-continued
2188
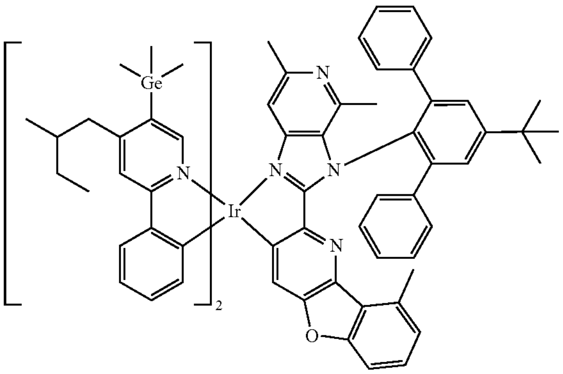
2189
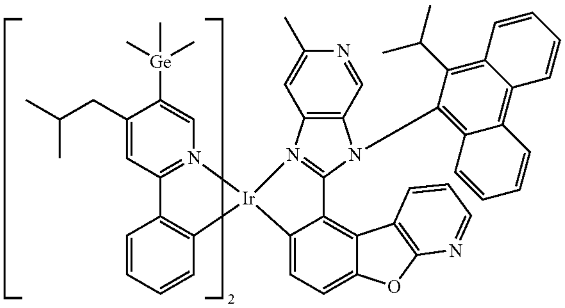
2190
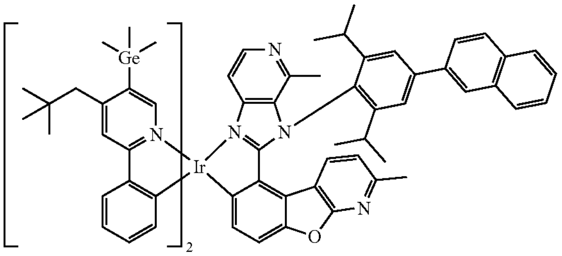
2191
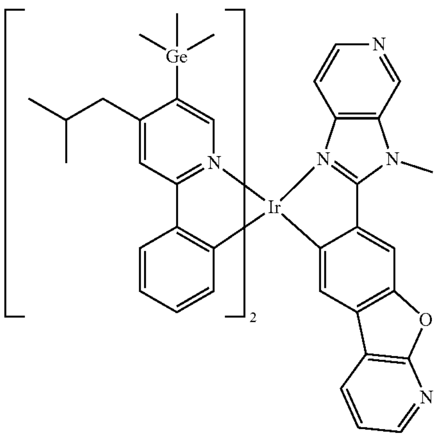

-continued
2192
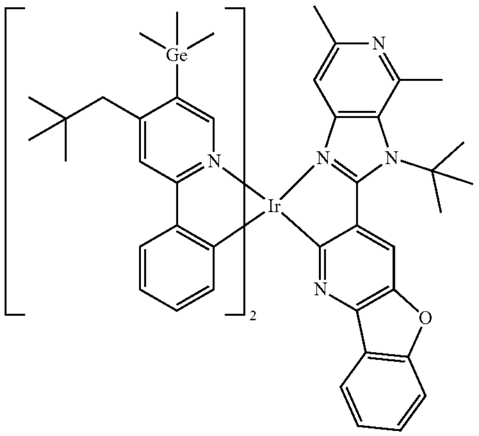
2193
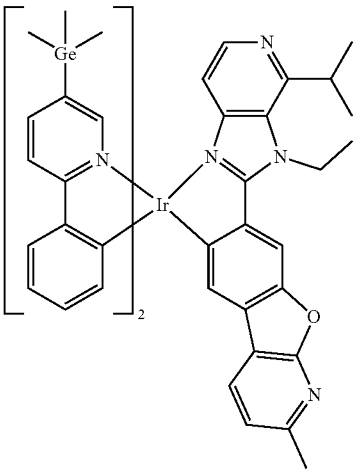
2194
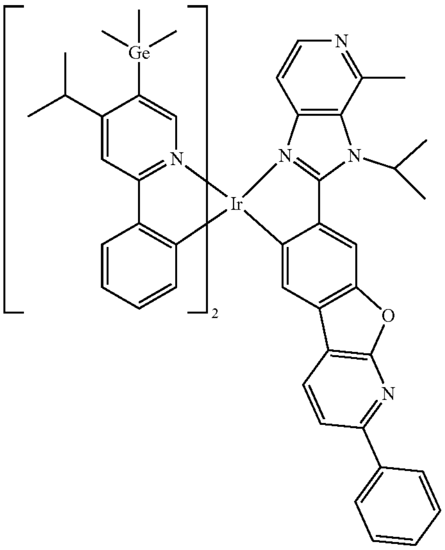
-continued
2195
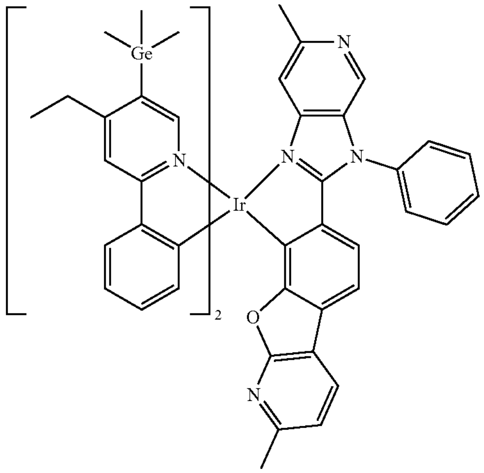
2196
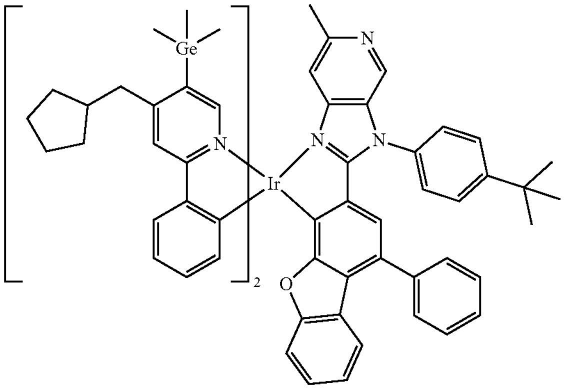
2197
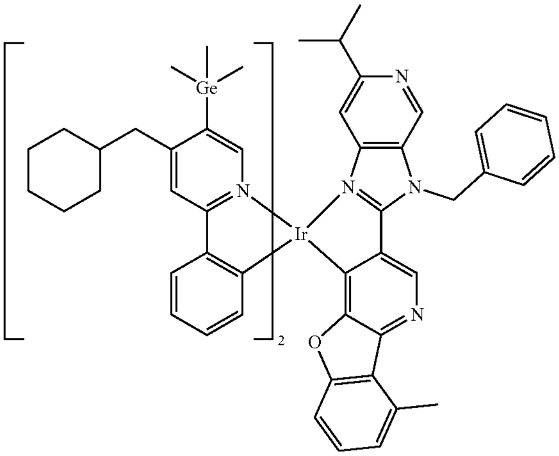

-continued
2198
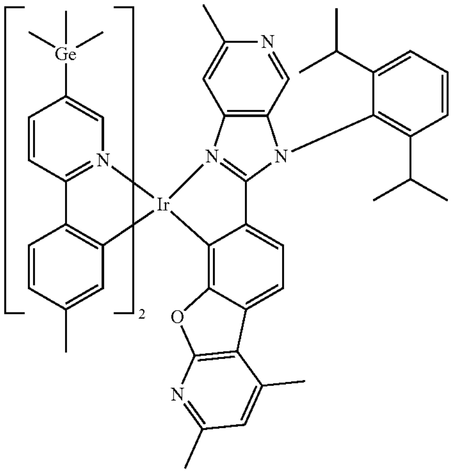
2199
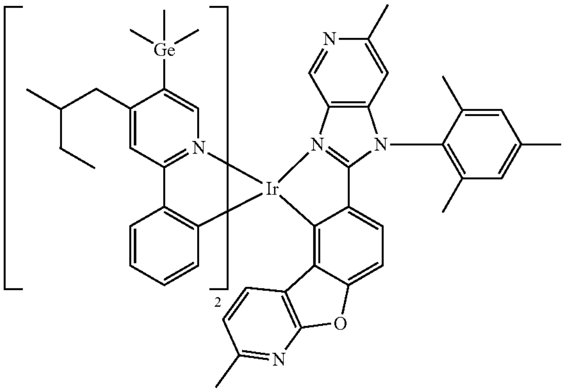
2200
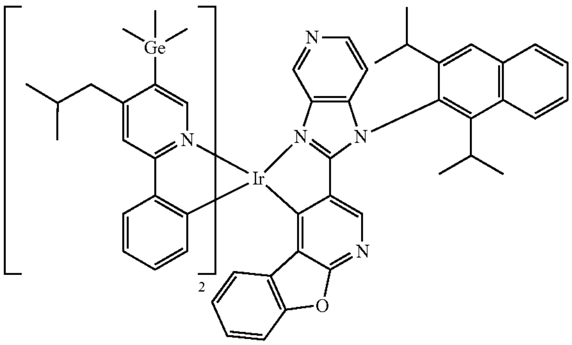
-continued
2201
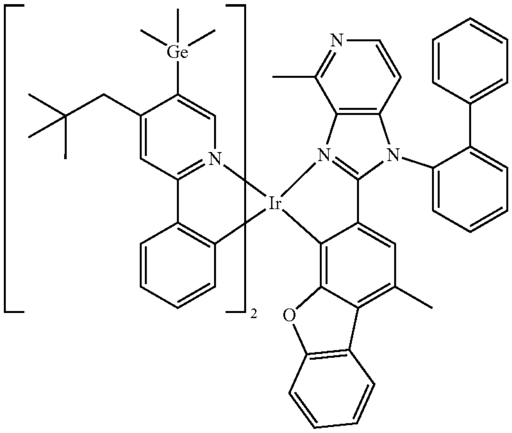
2202
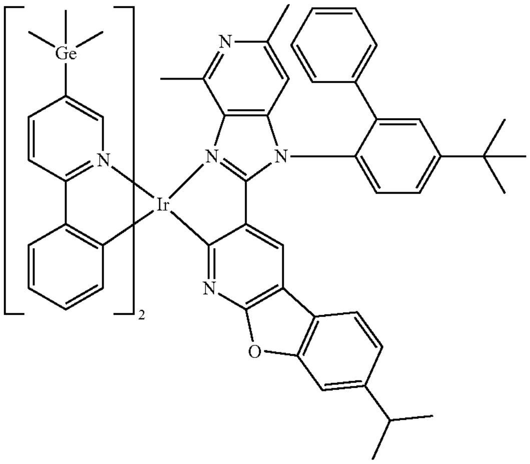
2203
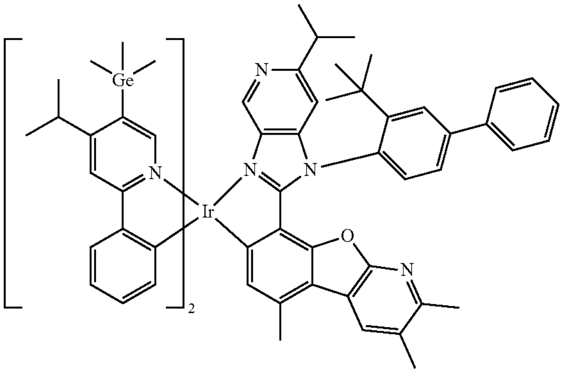

-continued
2204
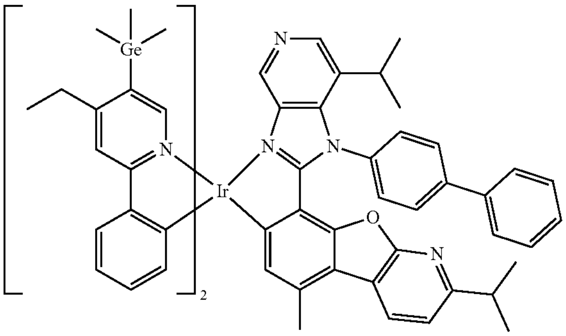
2205
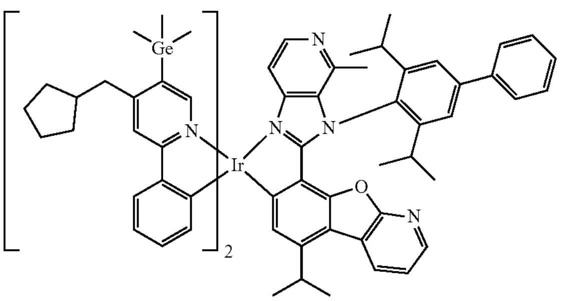
2206
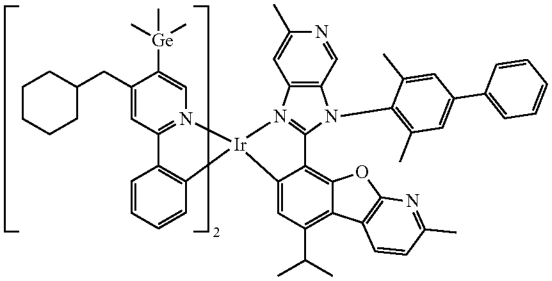
2207
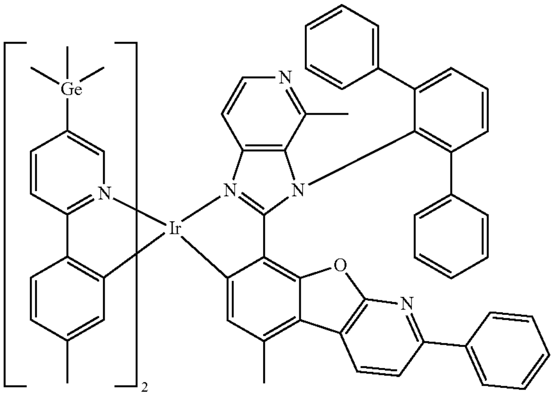
2208
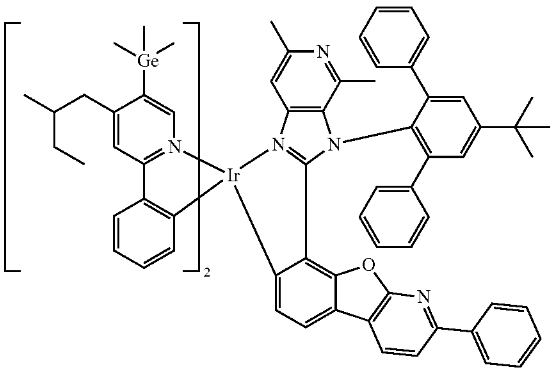
2209
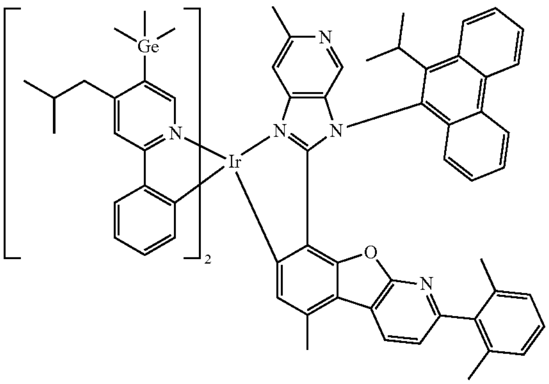
2210
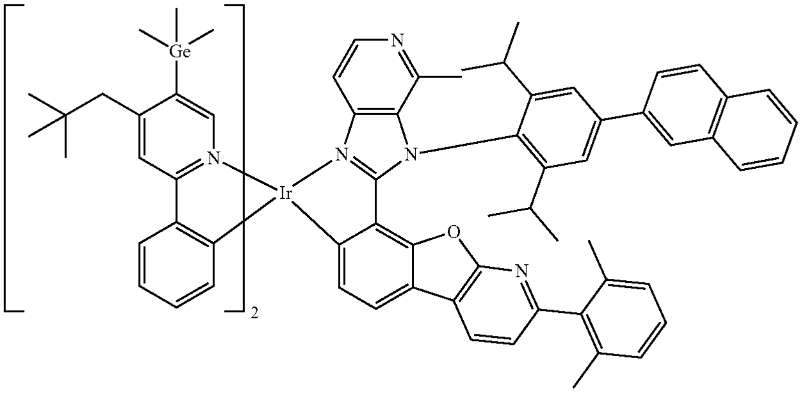

-continued
2211
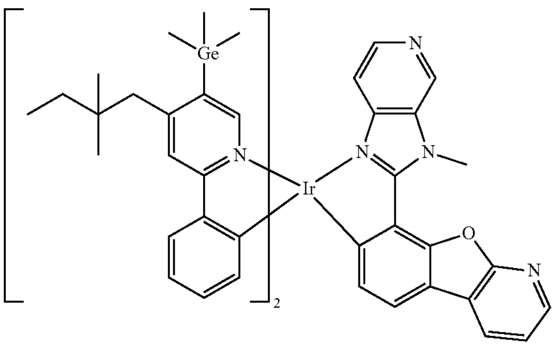
2212
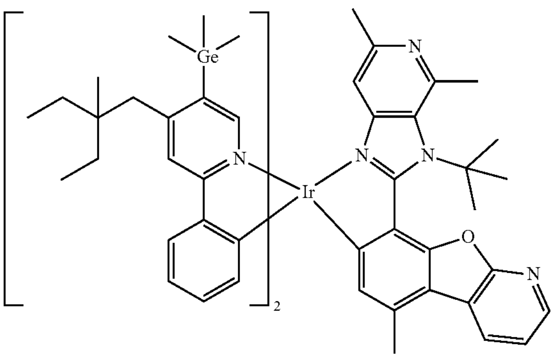
2213
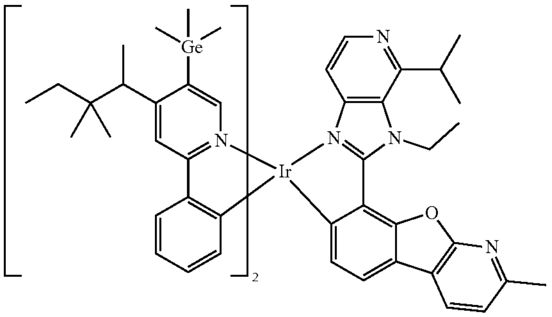
2214
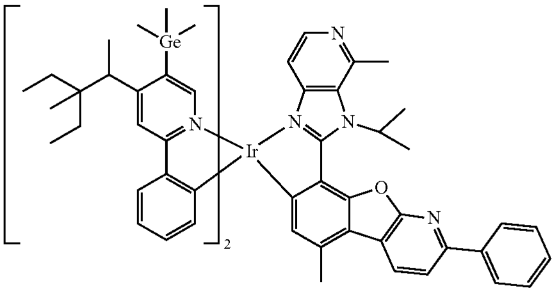
2215
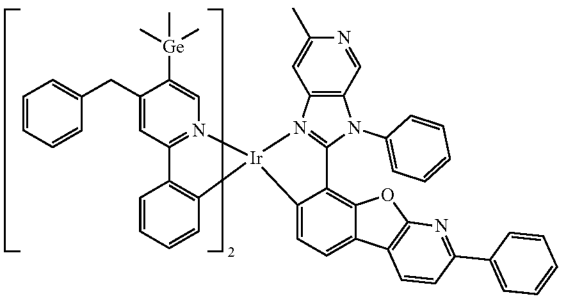
2216
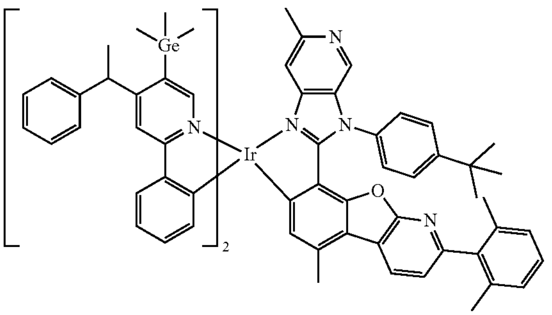
2217
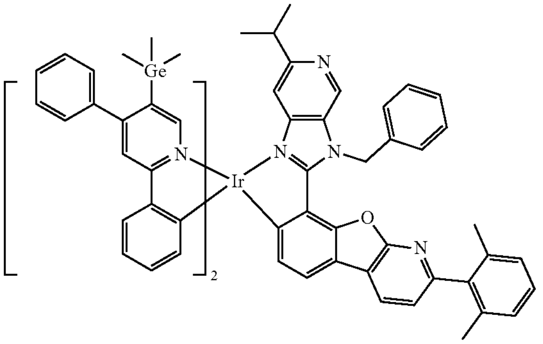
2218
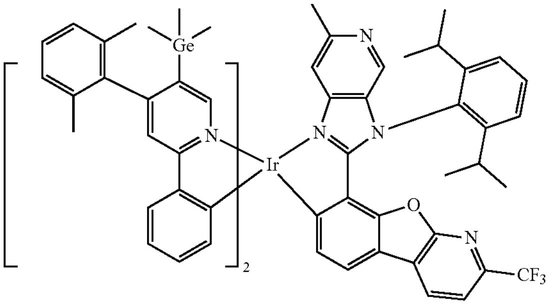

-continued
2219
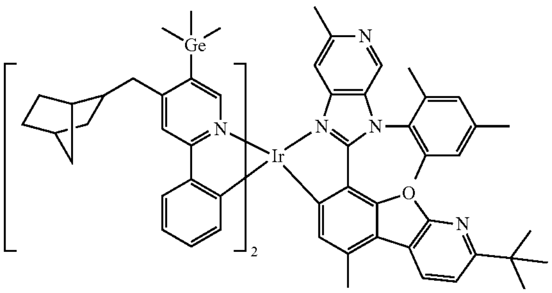
2220
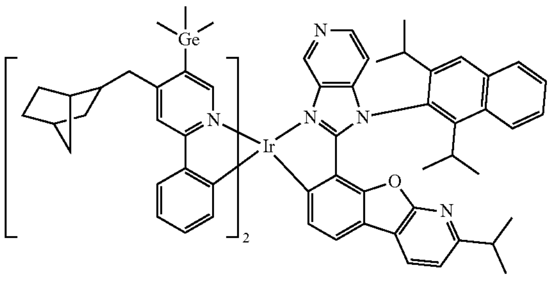
2221
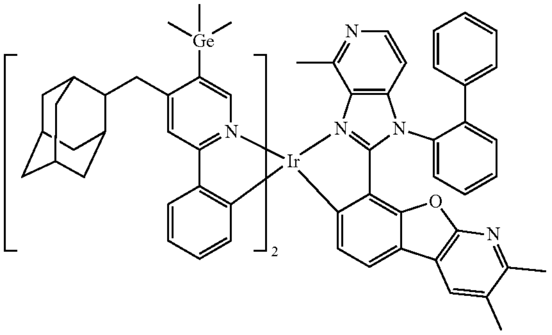
2222
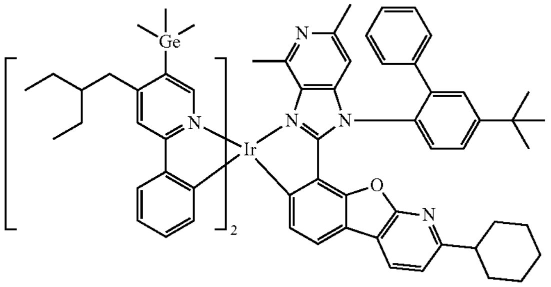
2223
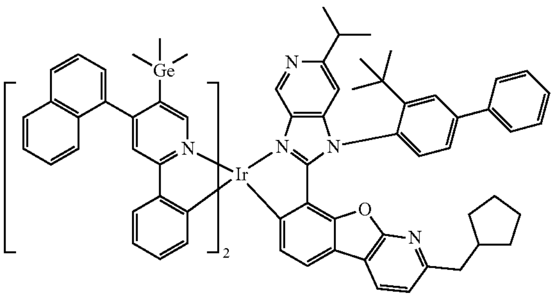
2224
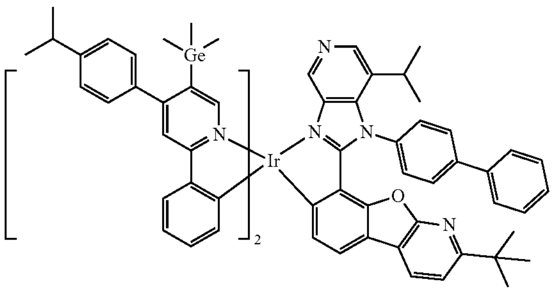
2225
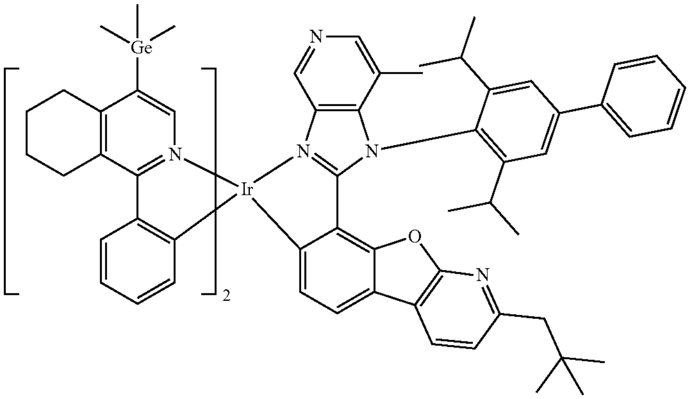

-continued
2226
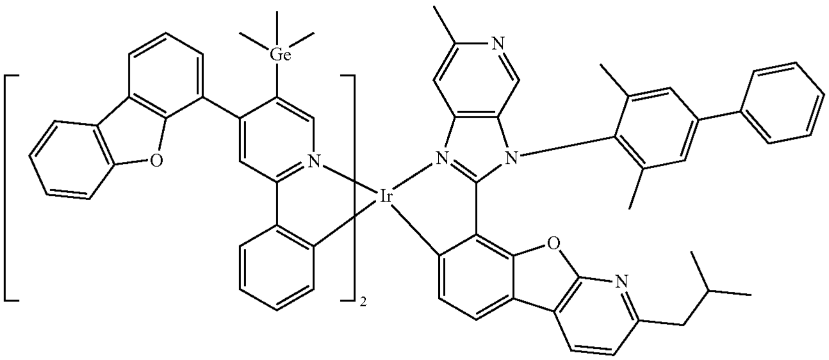
2227
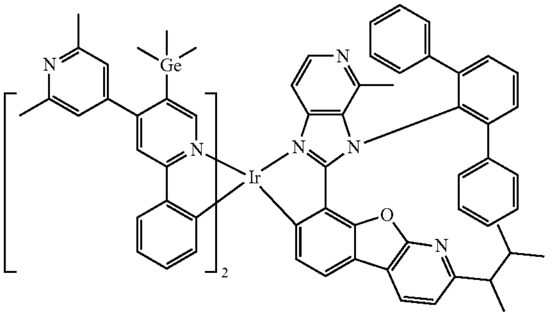
2228
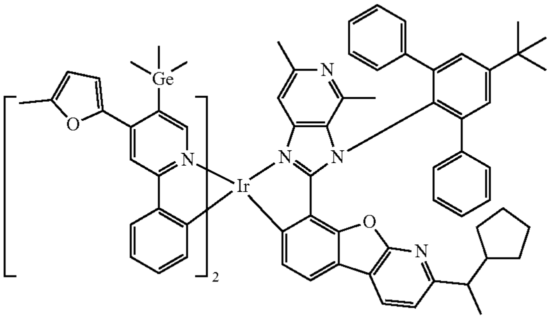
2229
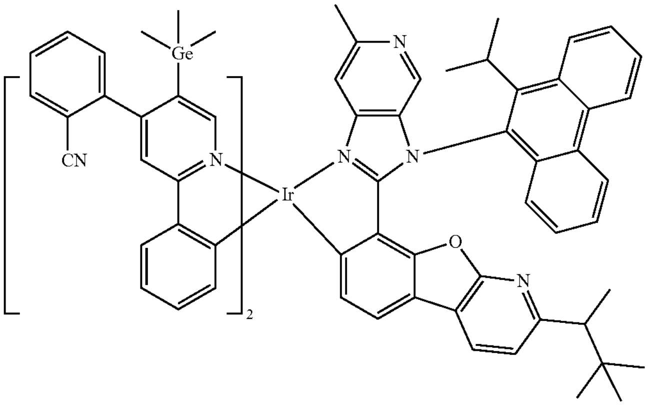
2230
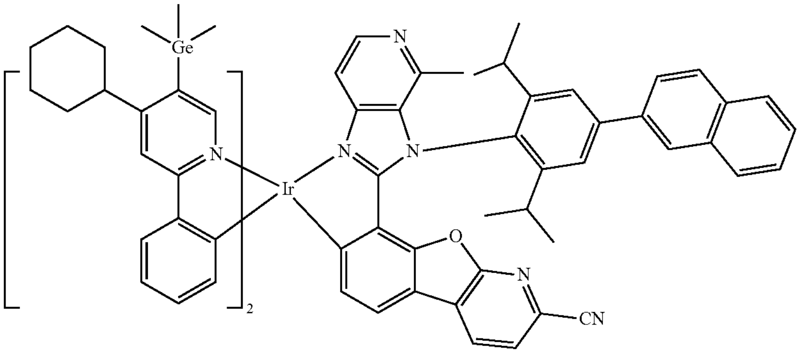

-continued
2231
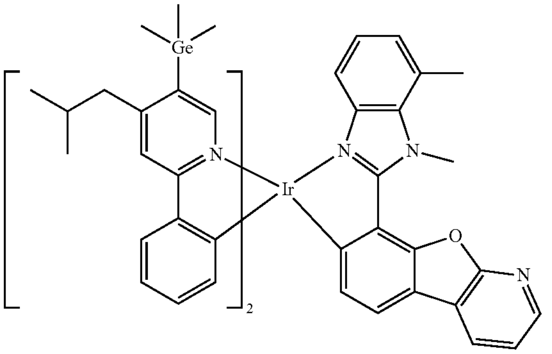
2232
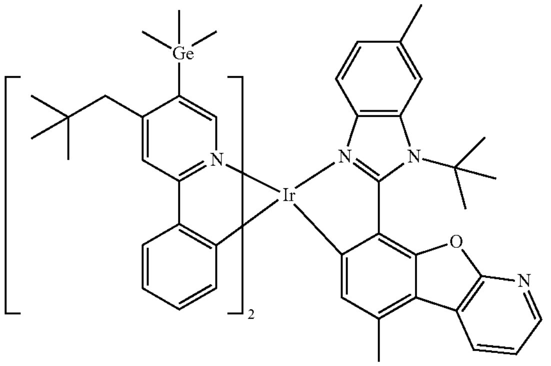
2233
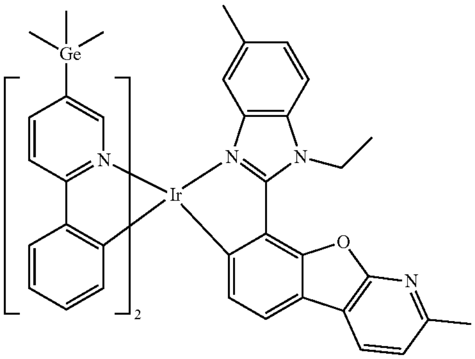
2234
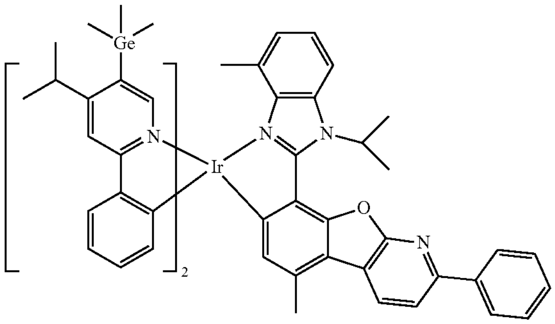
2235
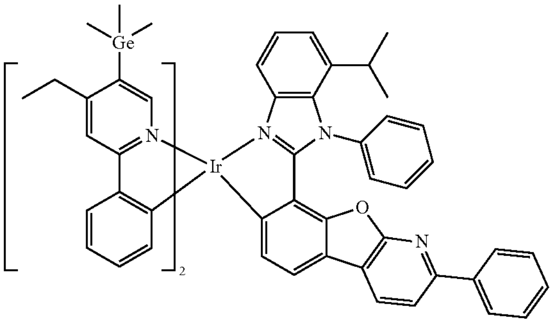
2236
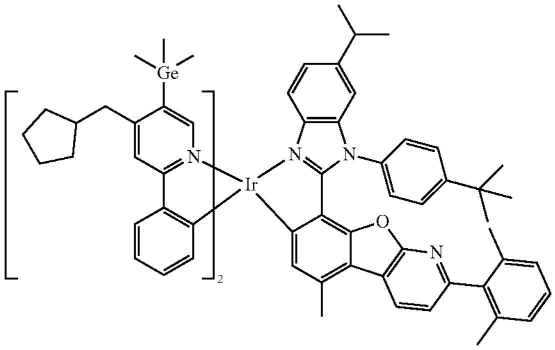
2237
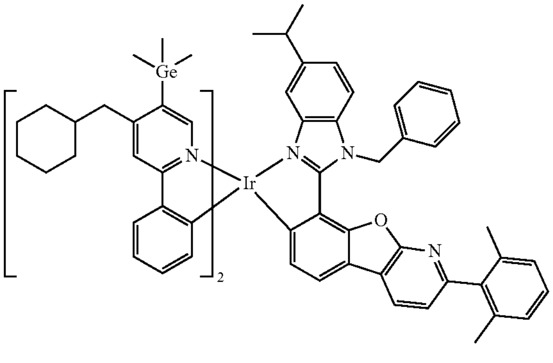
2238
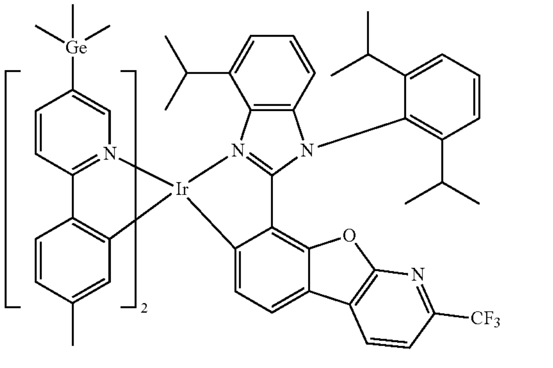

-continued
2239
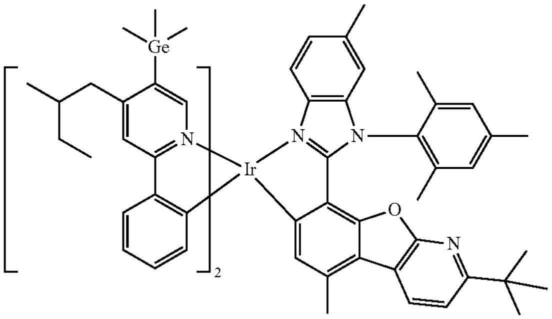
2240
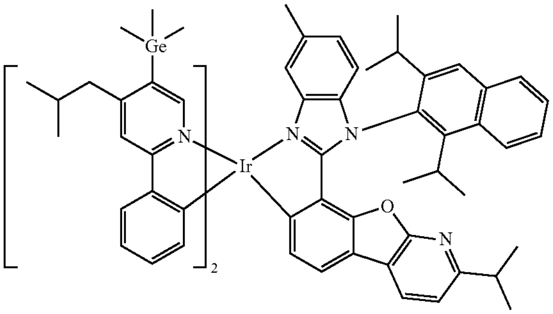
2241
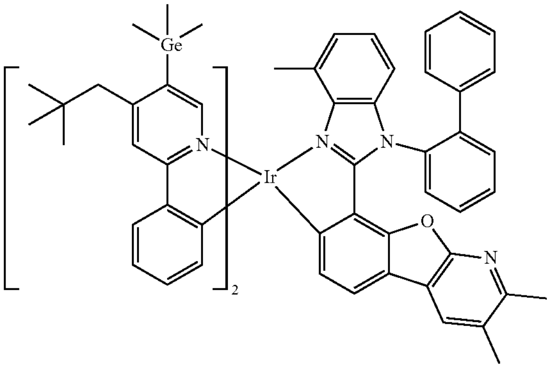
2242
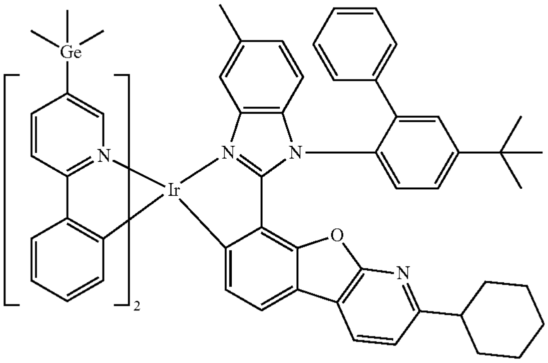
2243
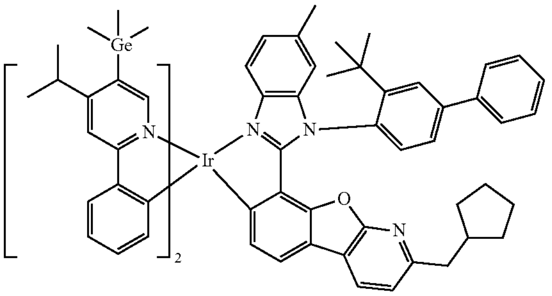
2244
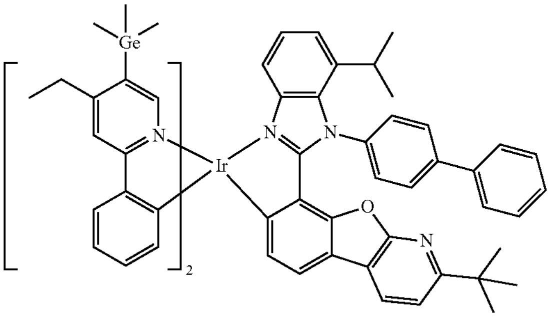
2245
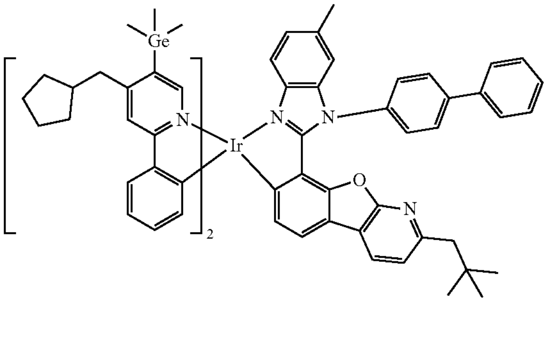
2246
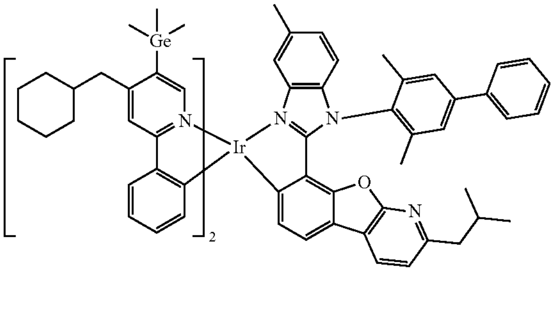

-continued
2247
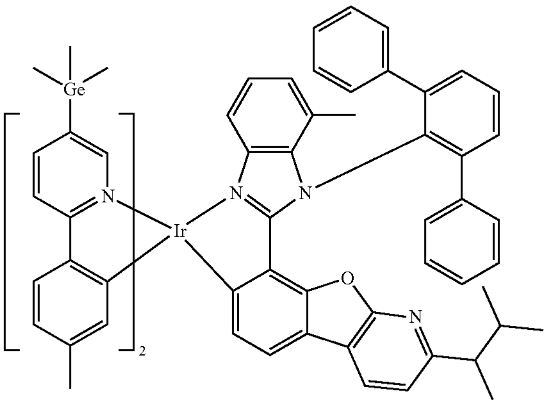
2248
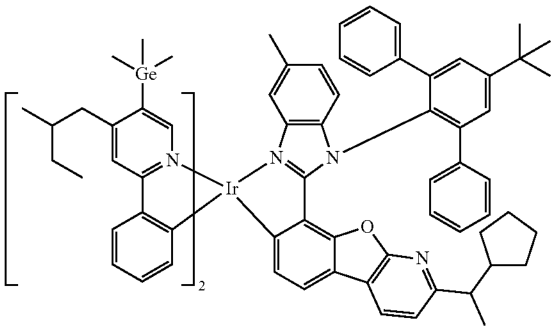
2249
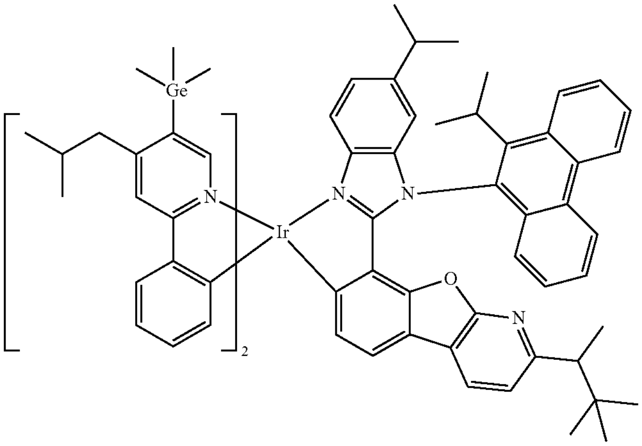
2250
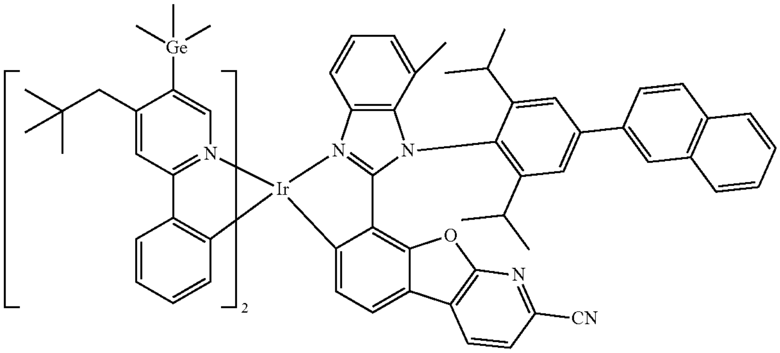
2251
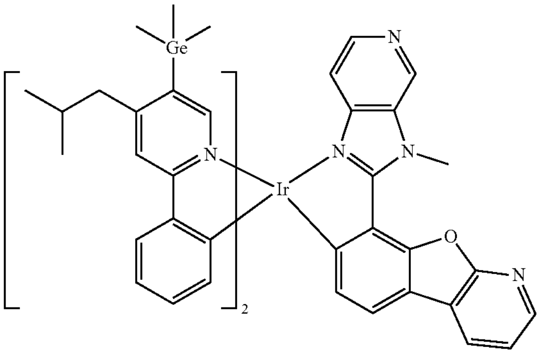
2252
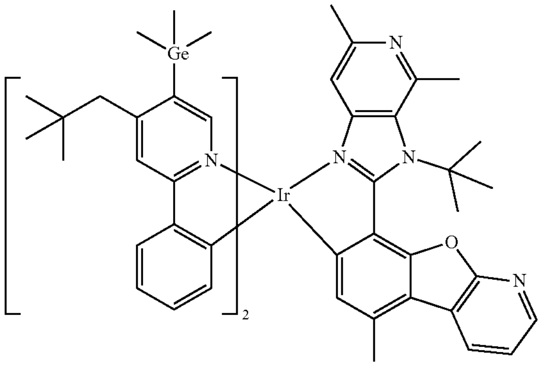

-continued
2253
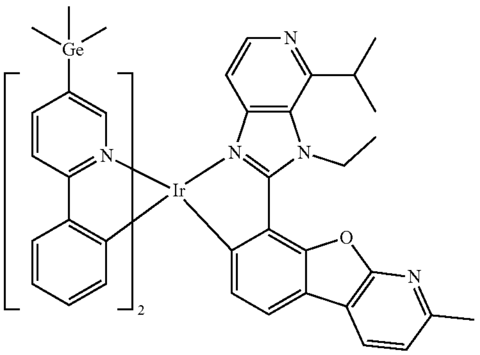
2254
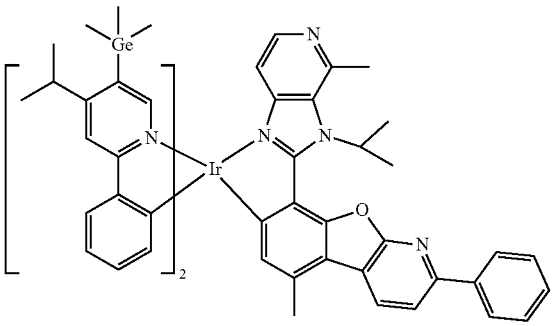
2255
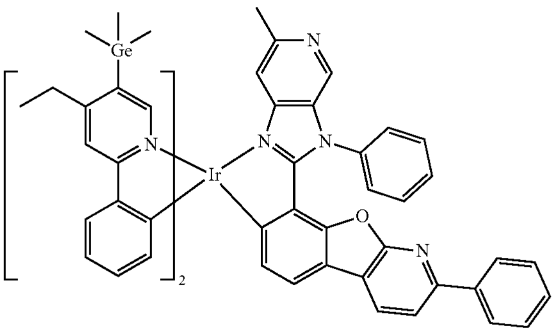
2256
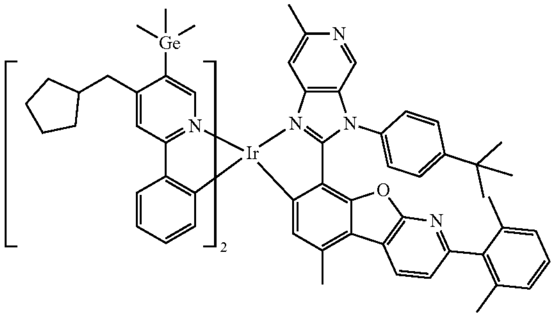
2257
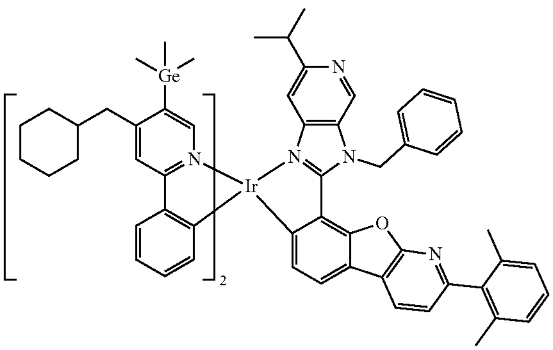
2258
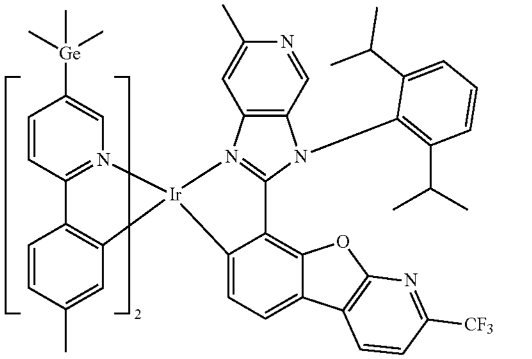
2259
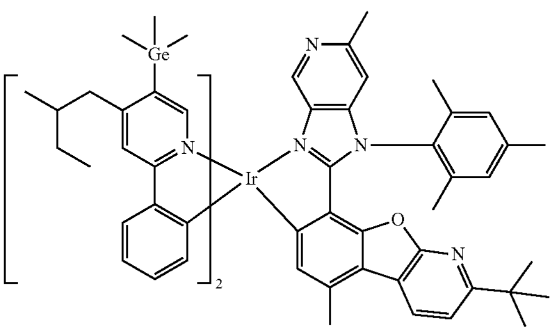
2260
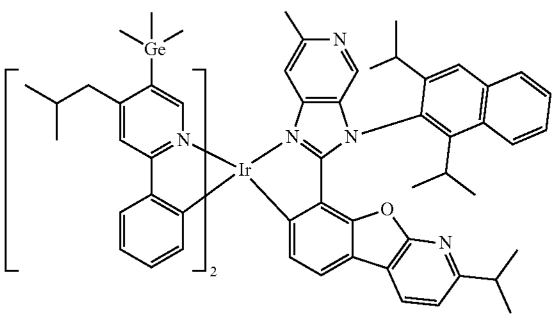

-continued
2261
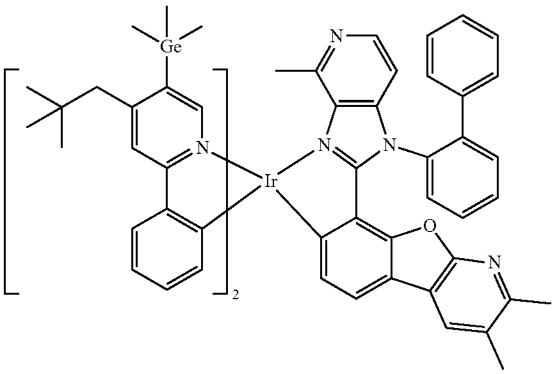
2262
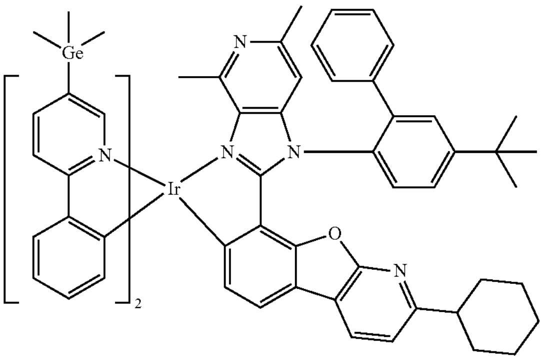
2263
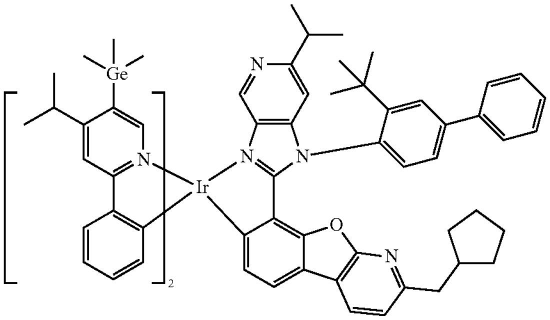
2264
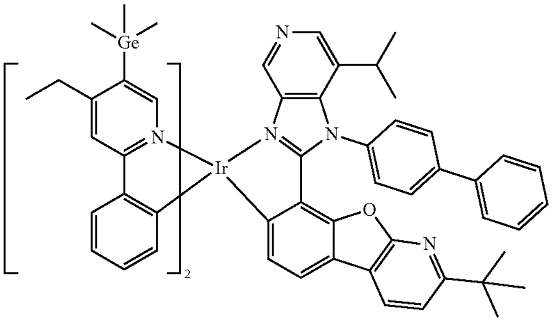
2265
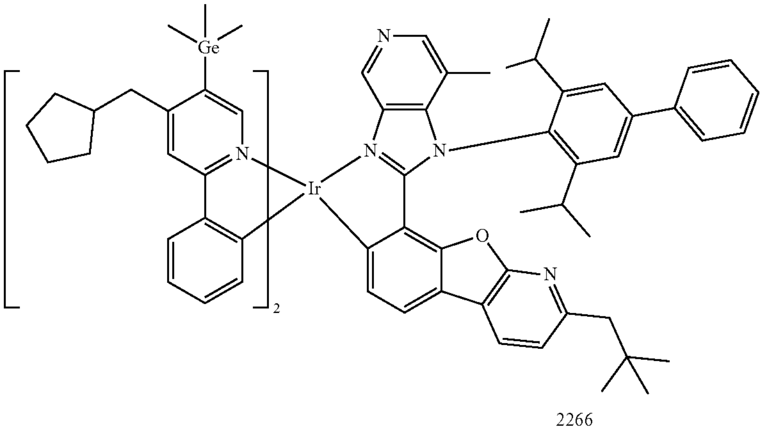
2266
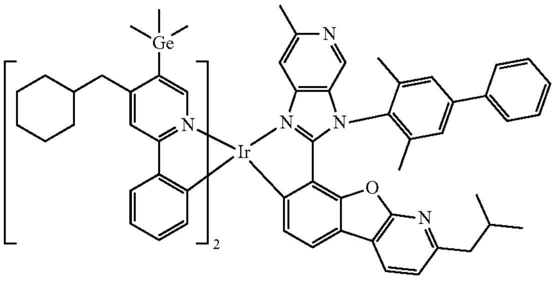
2267
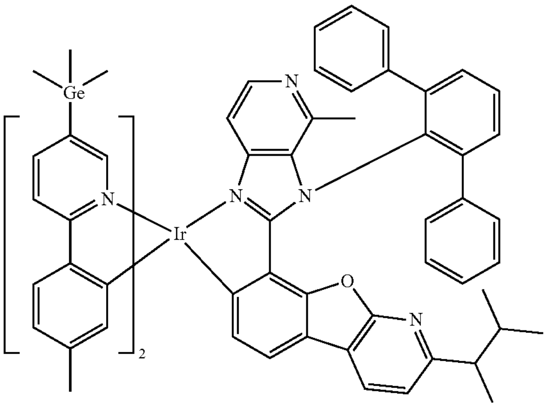

-continued
2268
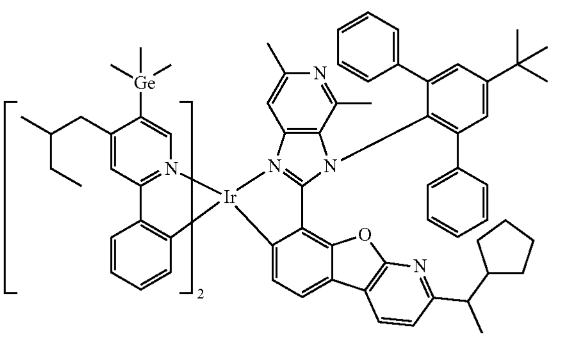
2269
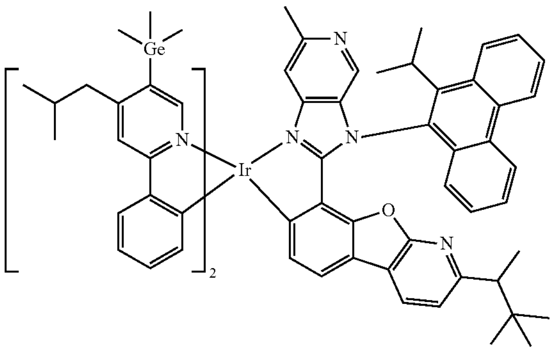
2270
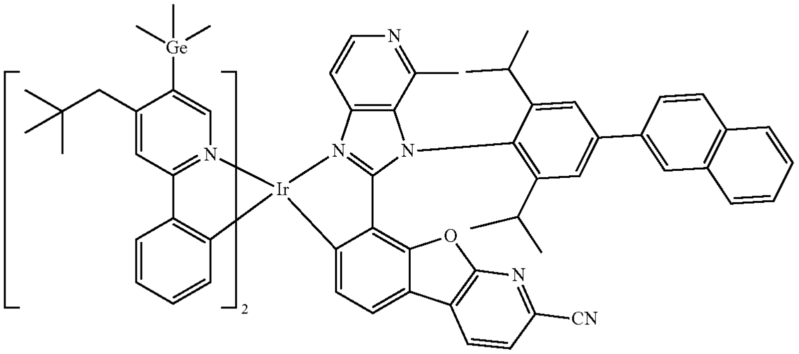
2271
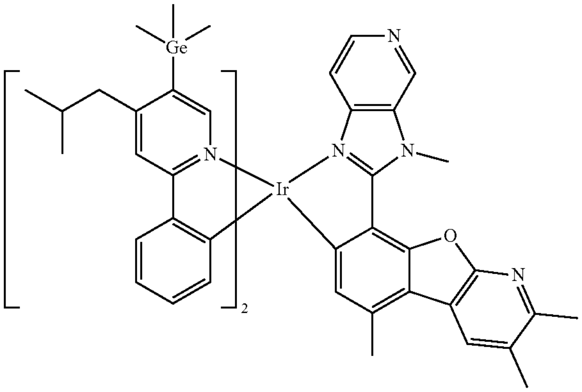
2272
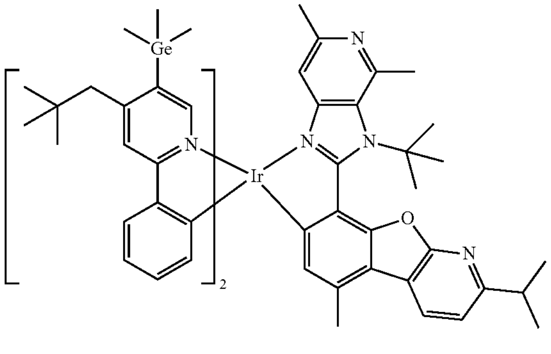
2273
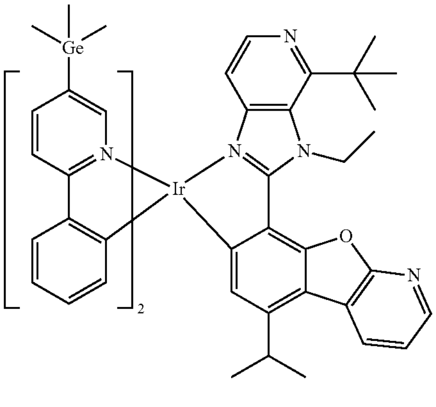
2274
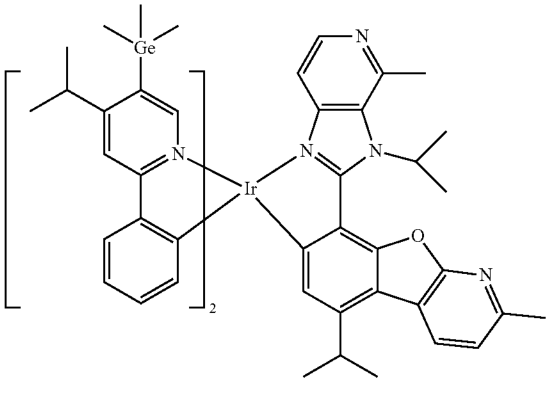

-continued
2275
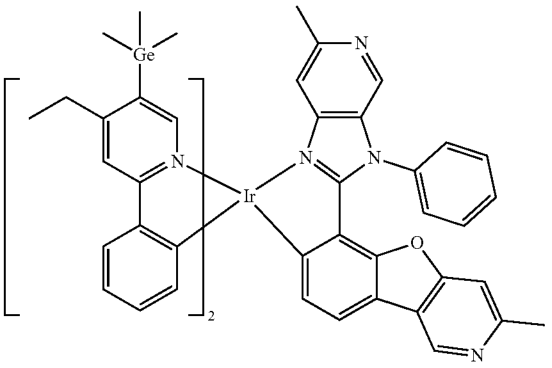
2276
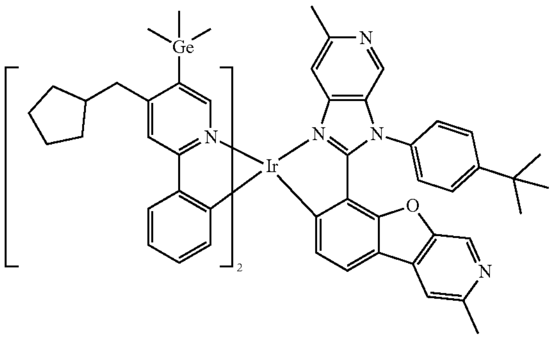
2277
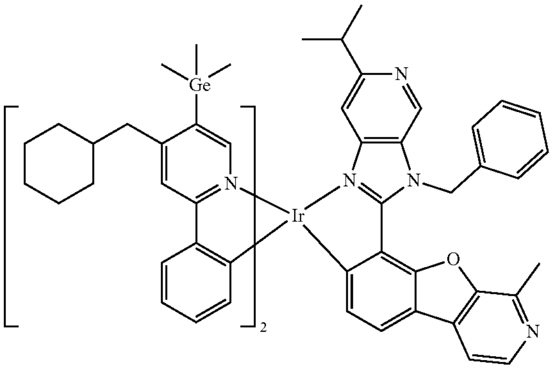
2278
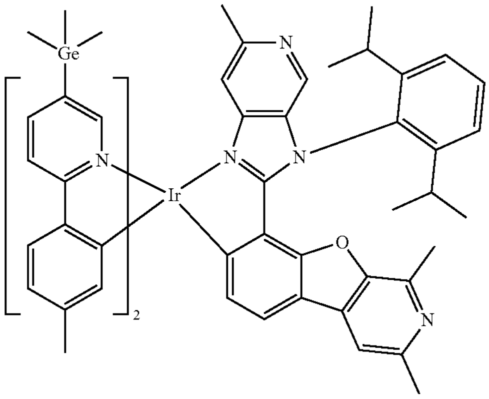
2279
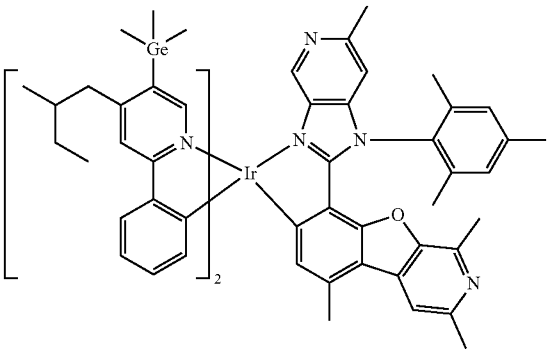
2280
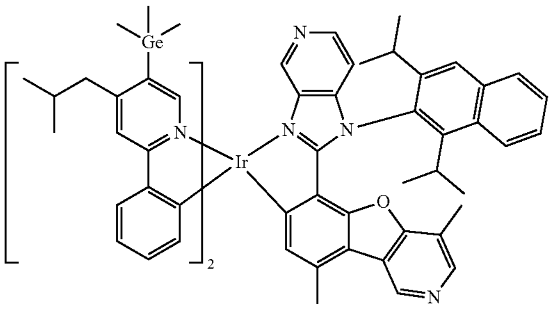
2281
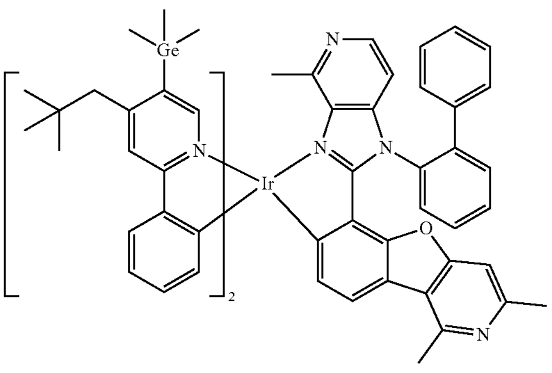
2282
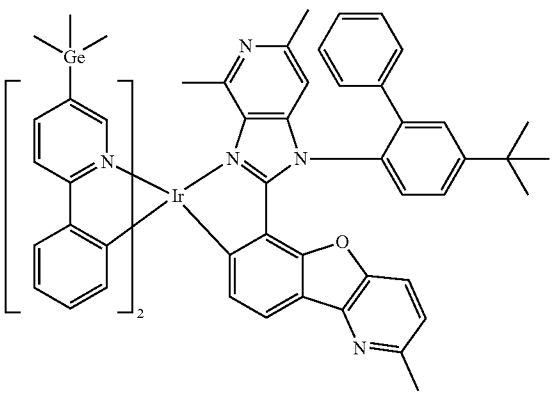

-continued
2283
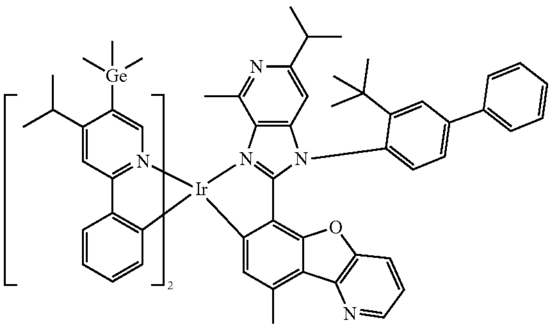
2284
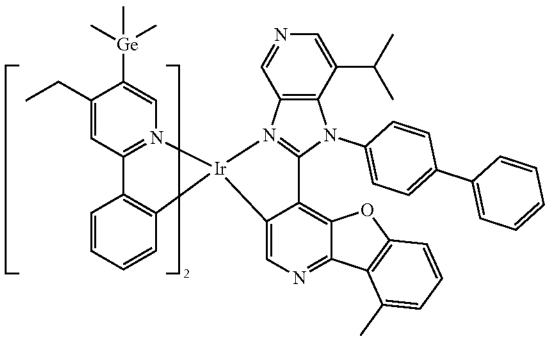
2285
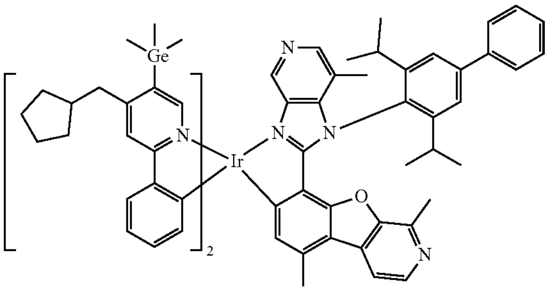
2286
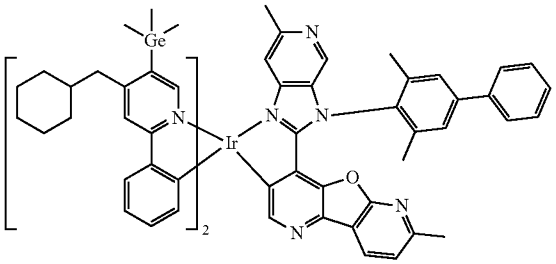
2287
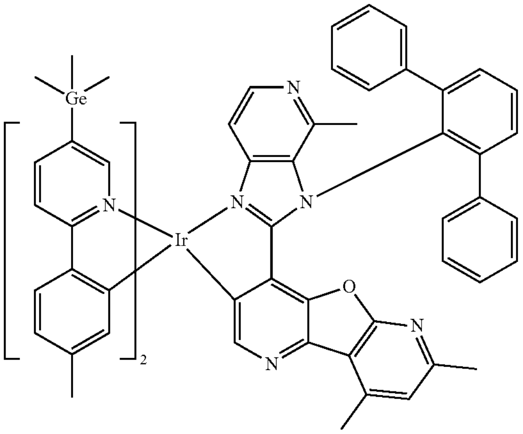
2288
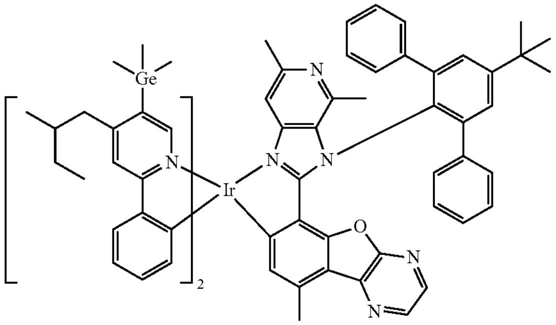
2289
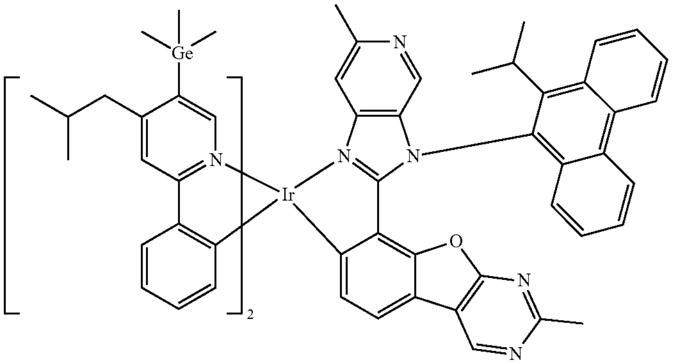

-continued
2290
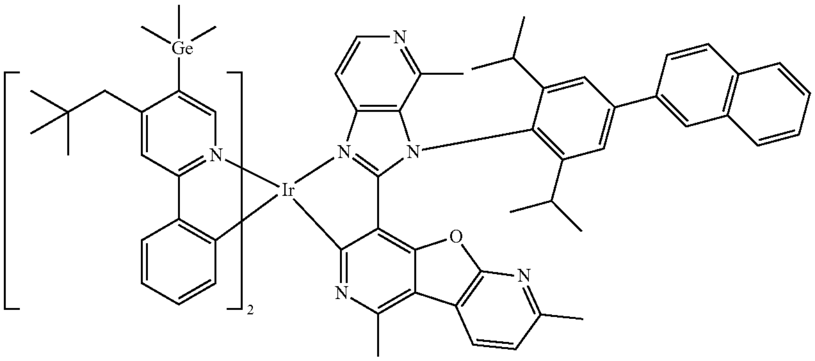
2291
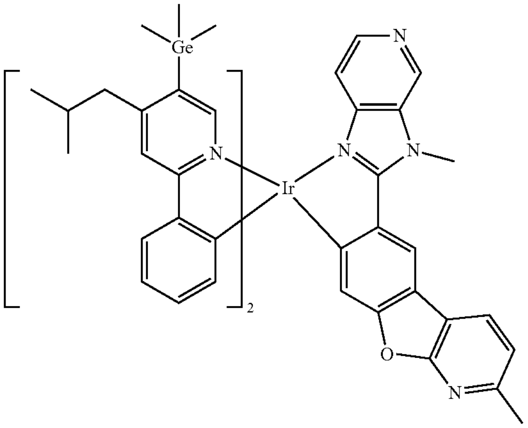
2292
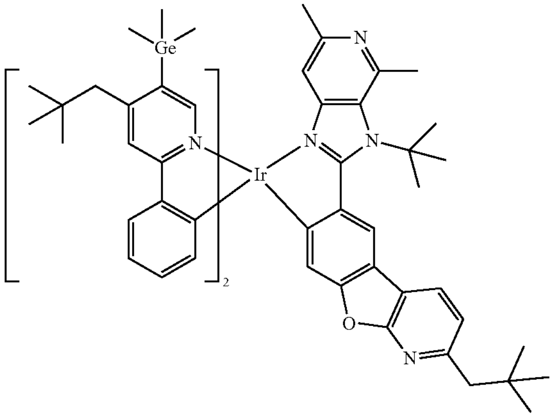
2293
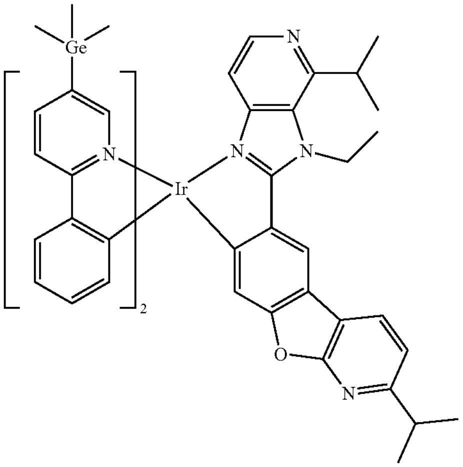
2294
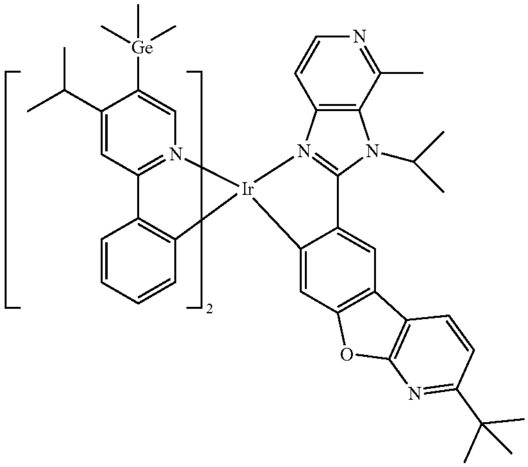

-continued
2295
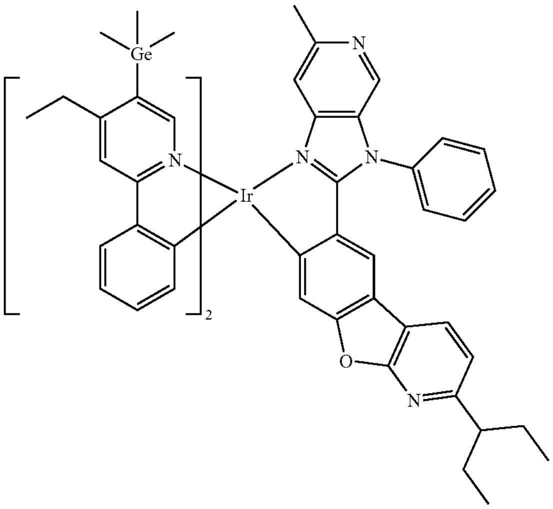
2296
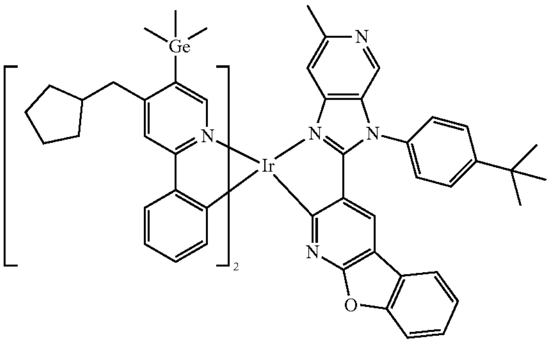
2297
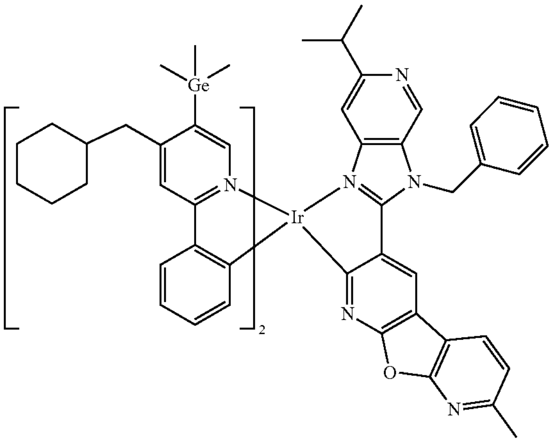
2298
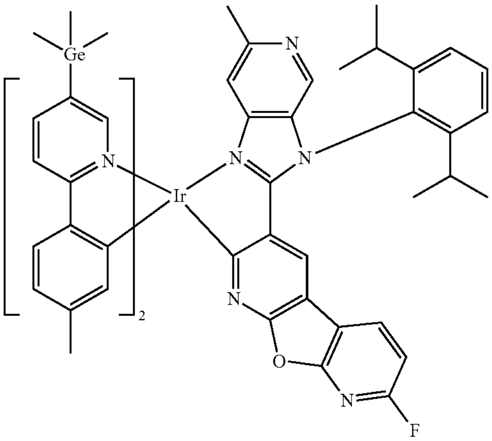
2299
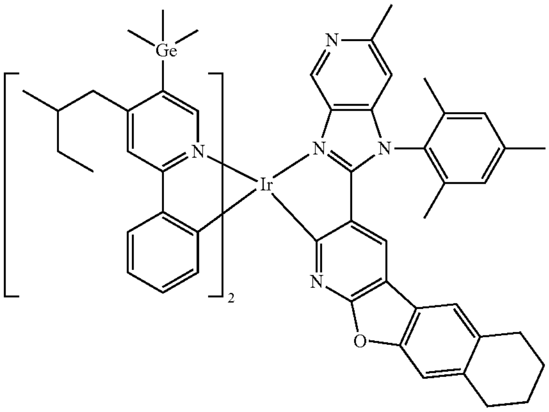
2300
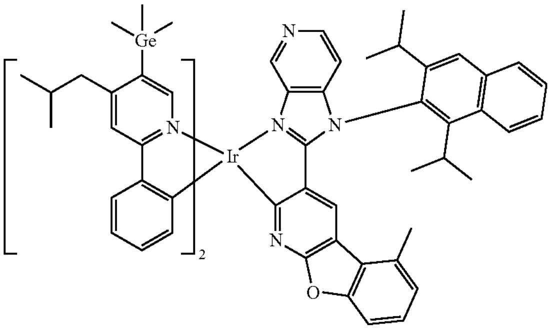

-continued
2301
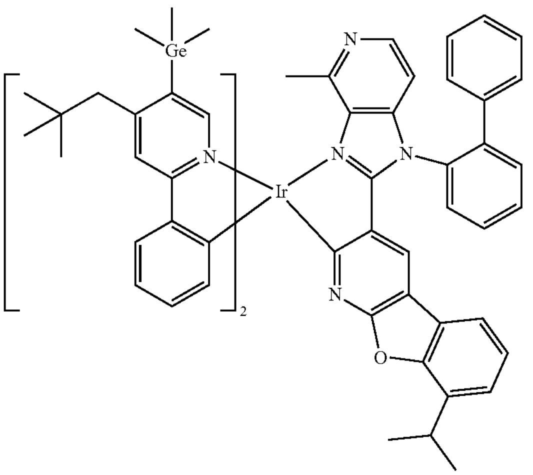
2302
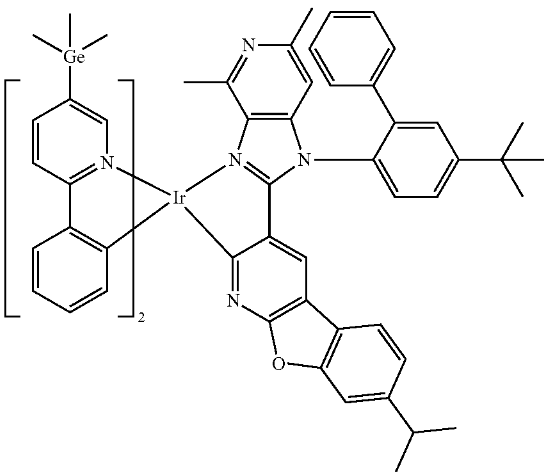
2303
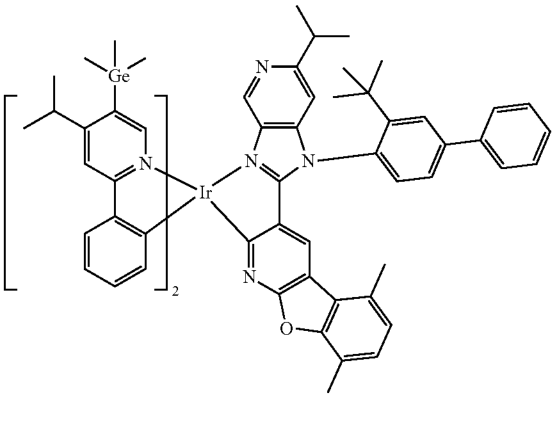
2304
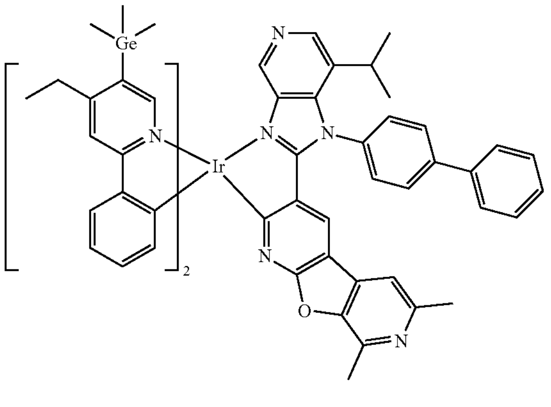
2305
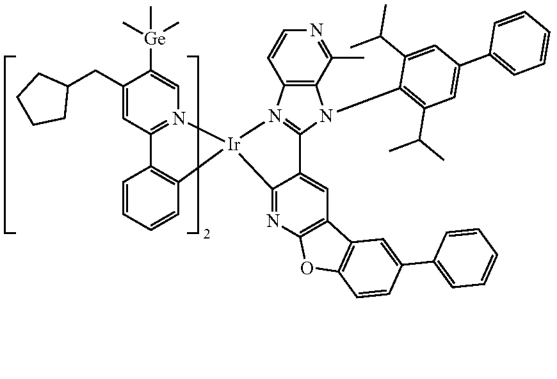
2306
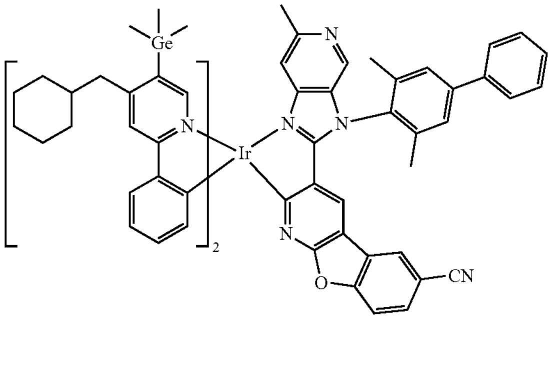

-continued
2307
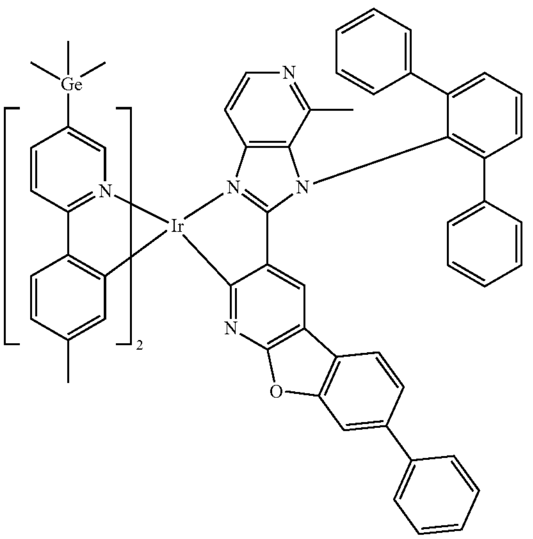
2308
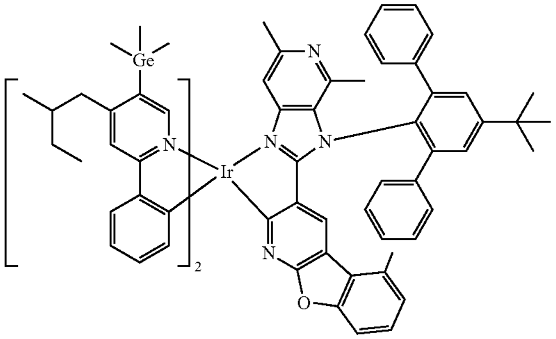
2309
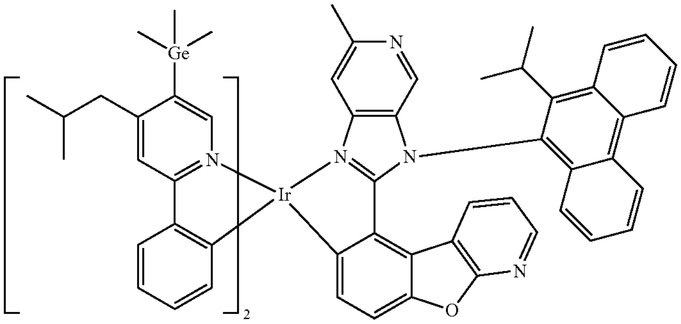
2310
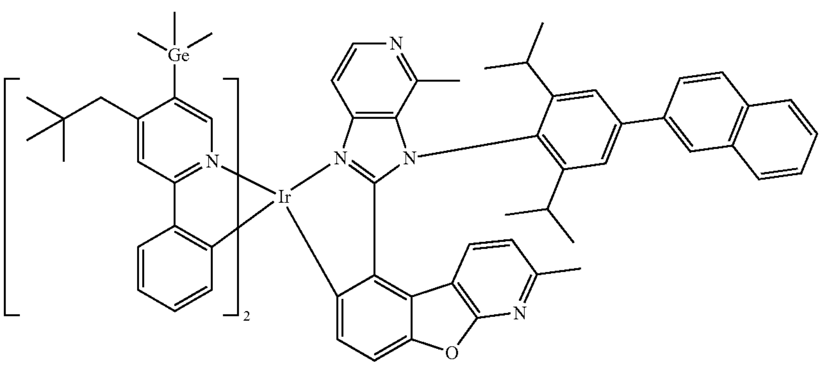

-continued
2311
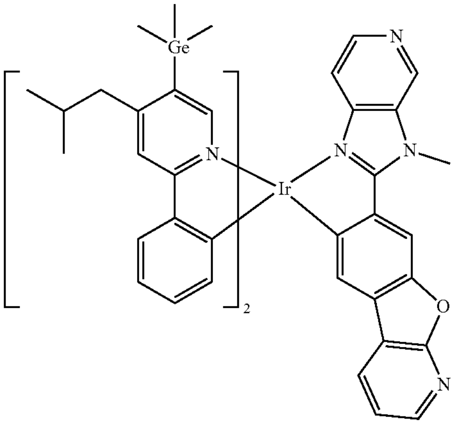
2312
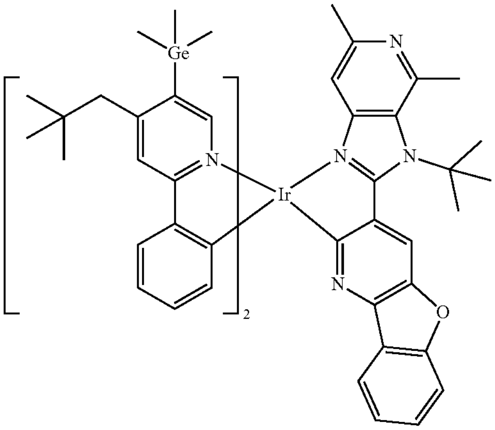
2313
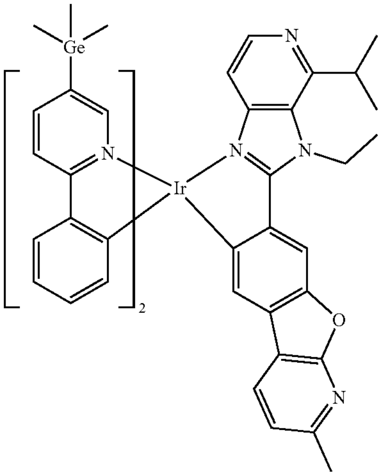

-continued
2314
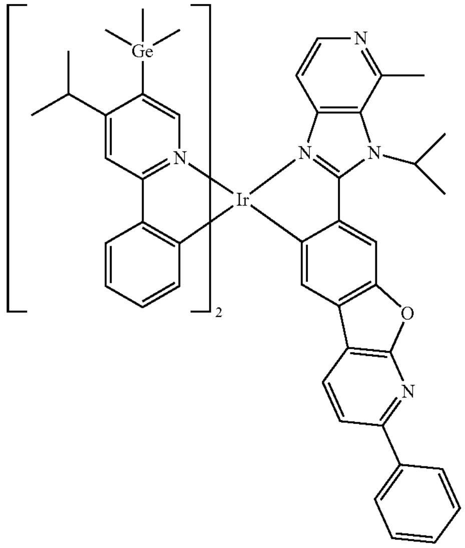
2315
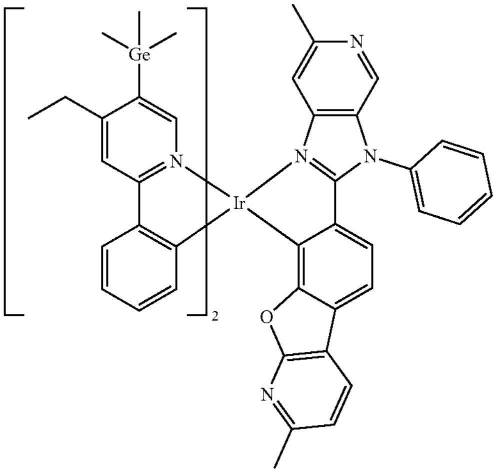
2316
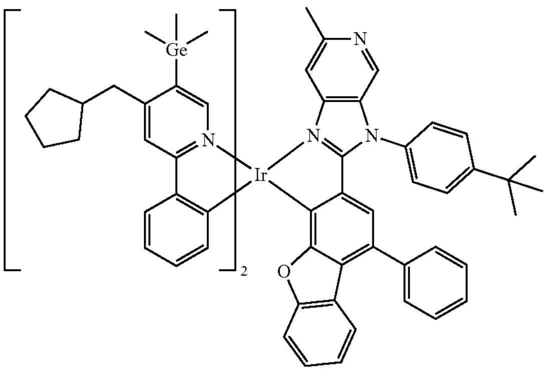
2317
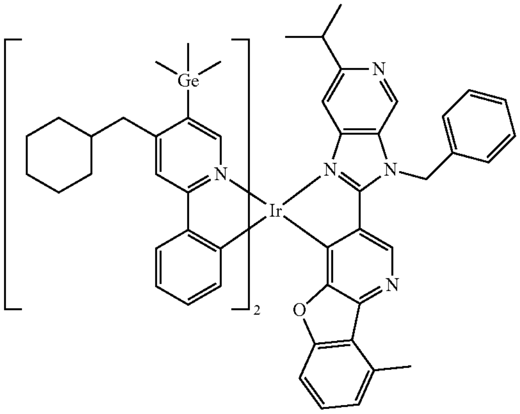
2318
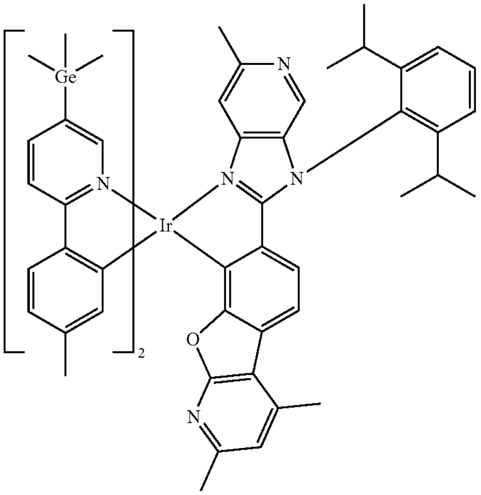
2319
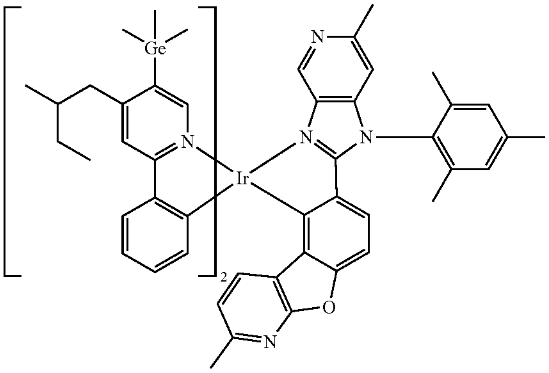

-continued
2320
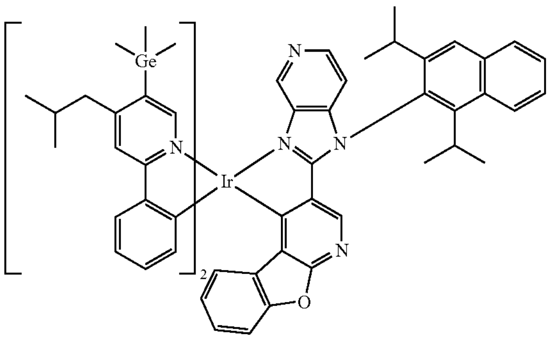
2321
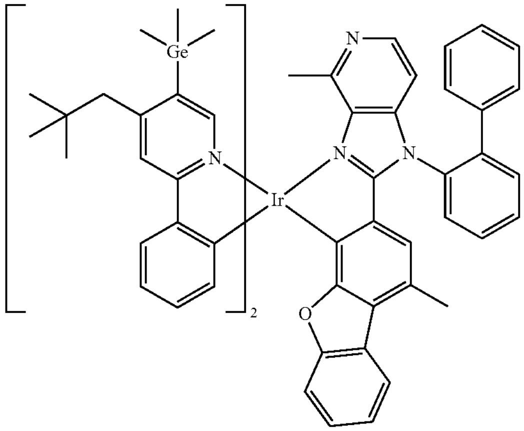
2322
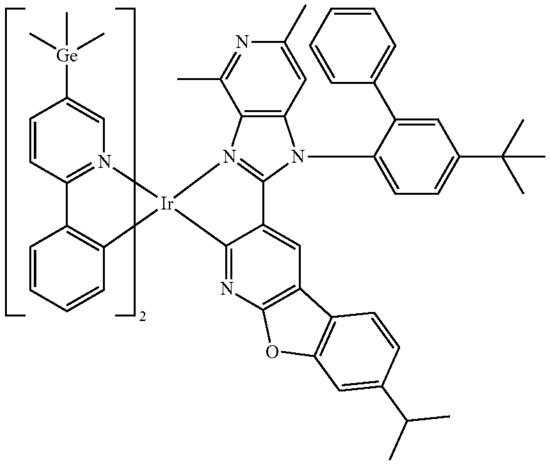
-continued
2323
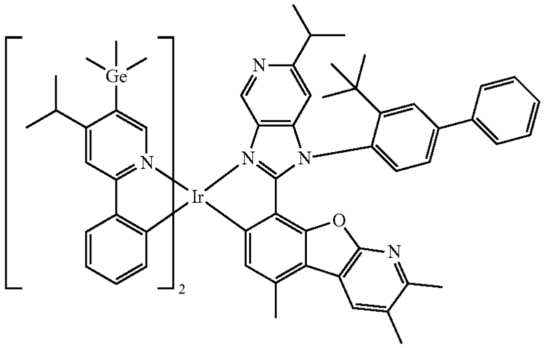
2324
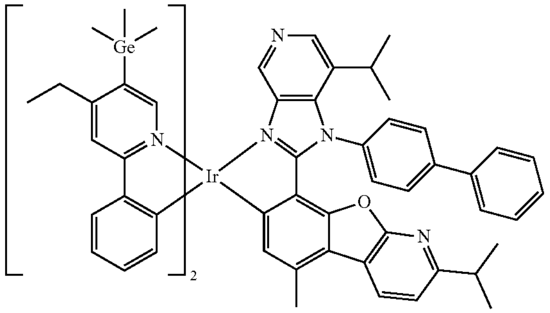
2325
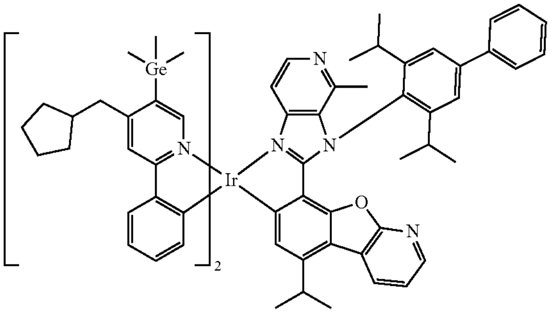
2326
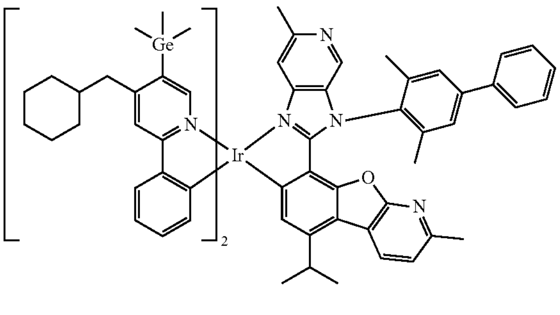

-continued
2327
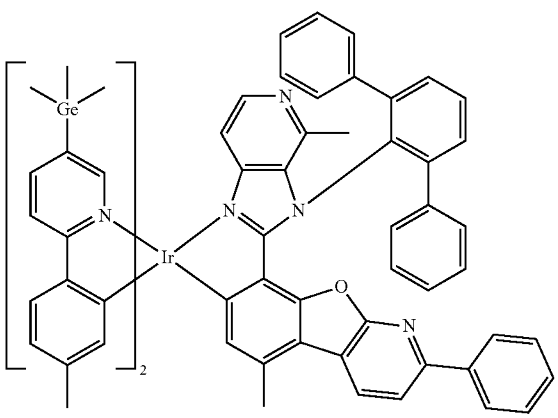
2328
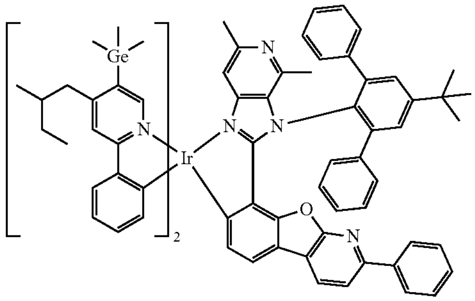
2329
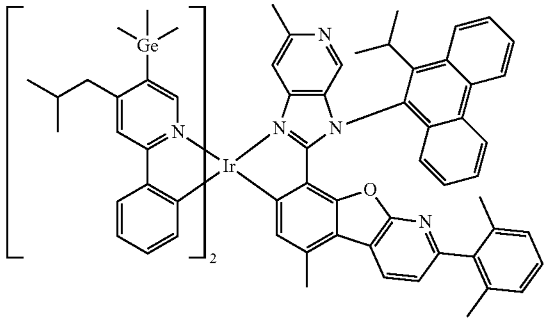
2330
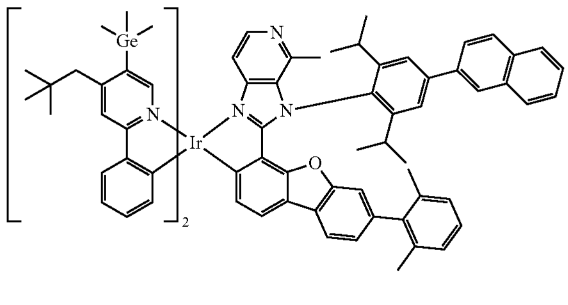
-continued
2331
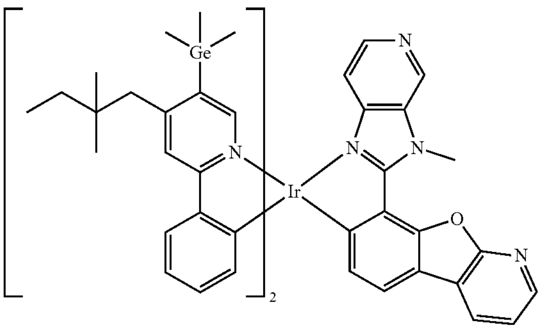
2332
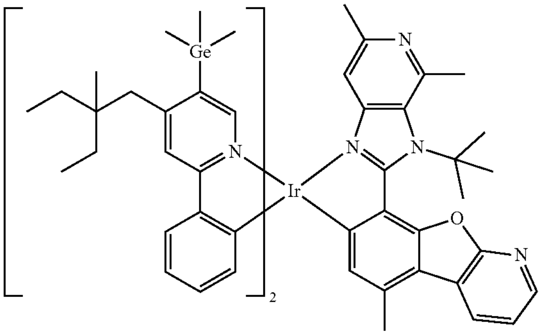
2333
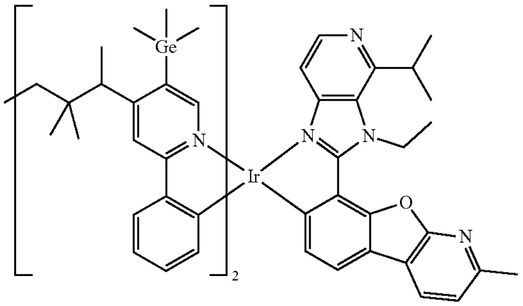
2334
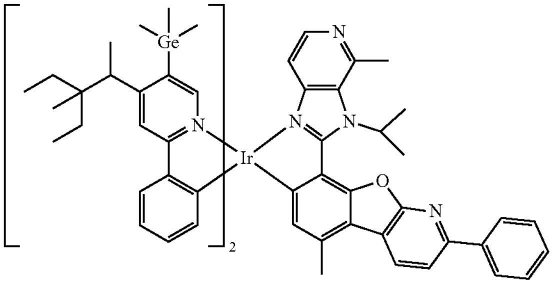
2335
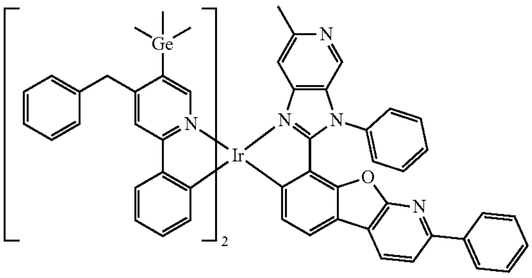

-continued
2336
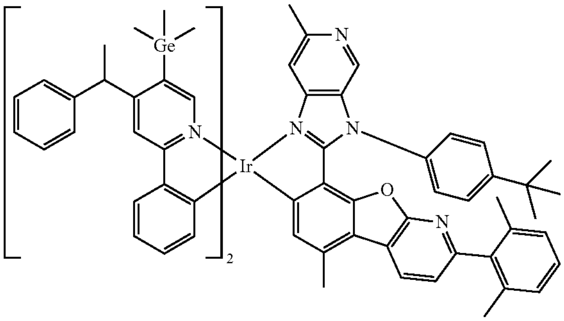
2337
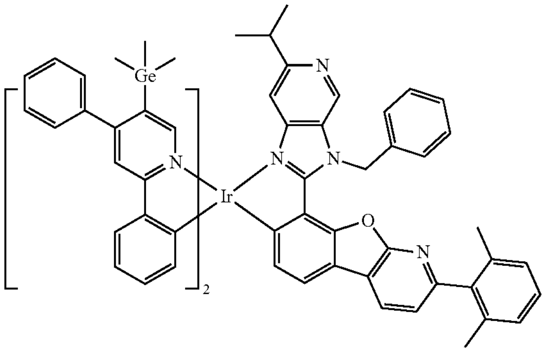
2338
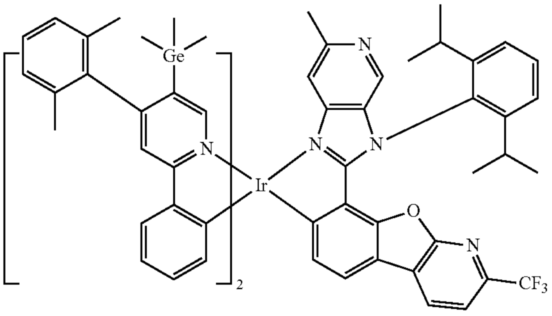
2339
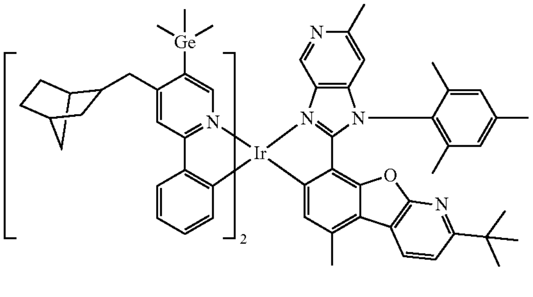
2340
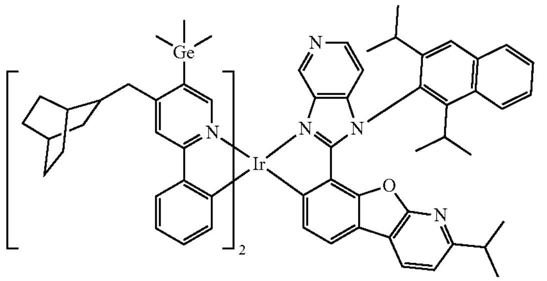
2341
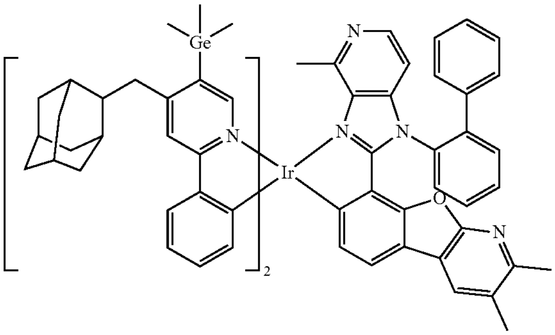
2342
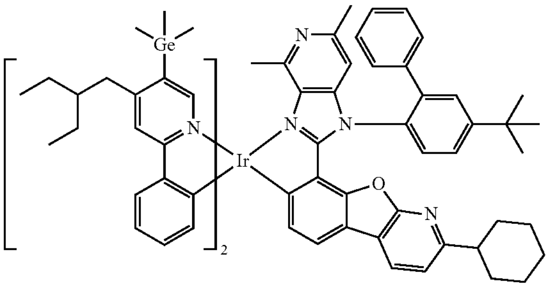
2343
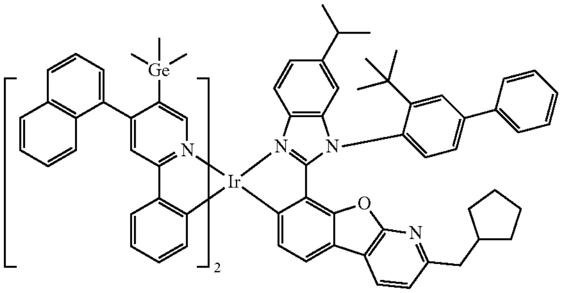
2344
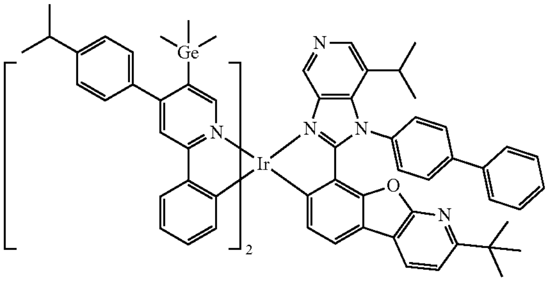

-continued
2345
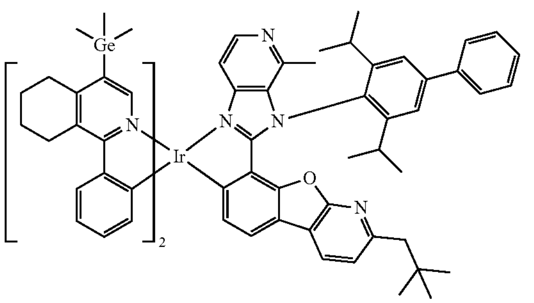
2346
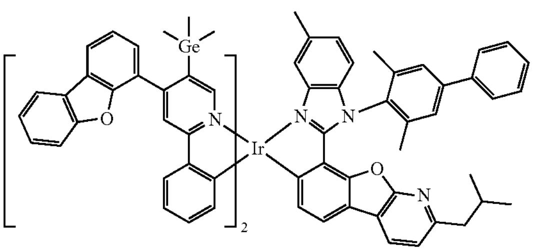
2347
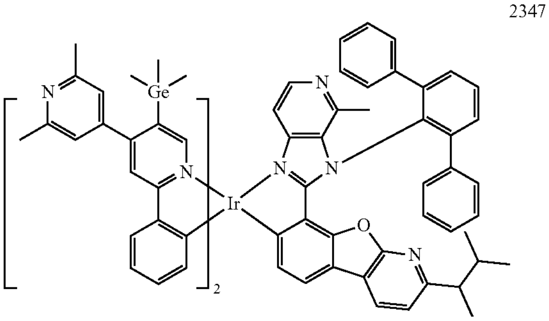
2348
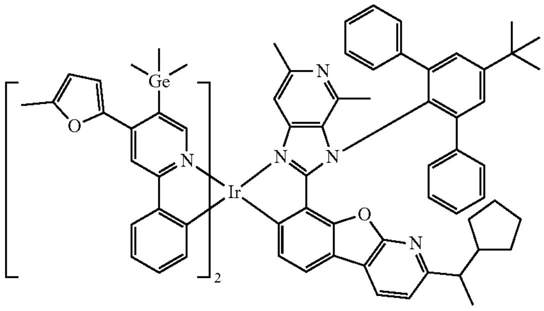
2349
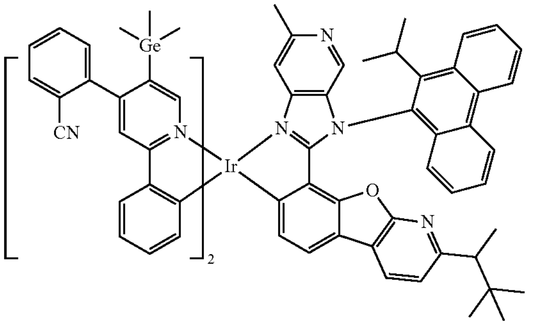
-continued
2350
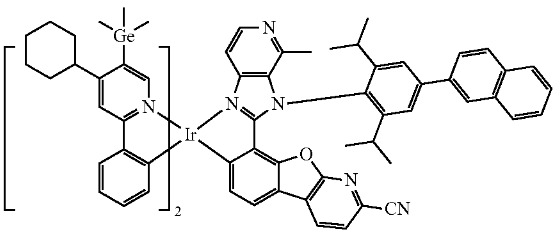
2351
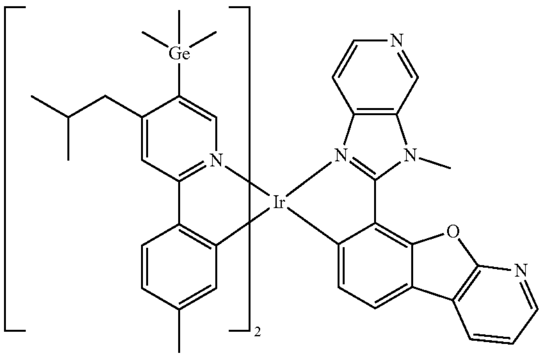
2352
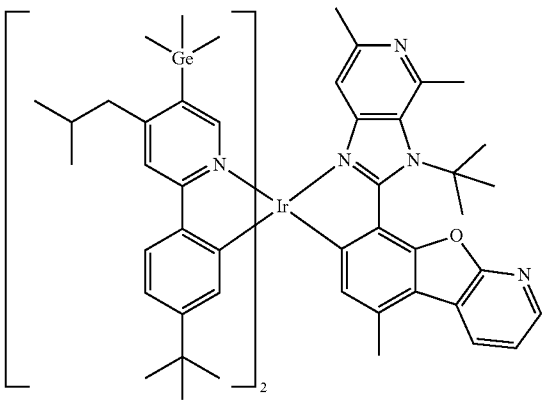
2353
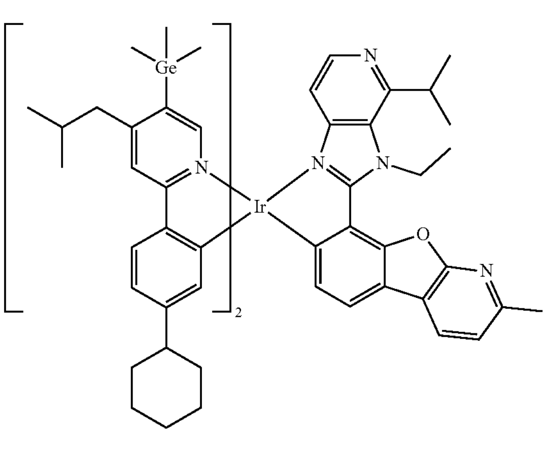

-continued
2354
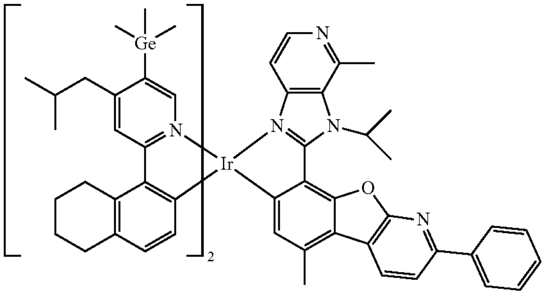
2355
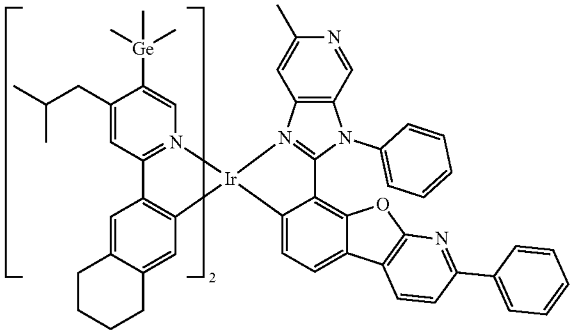
2356
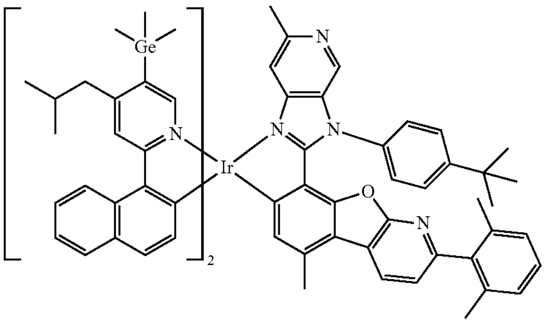
2357
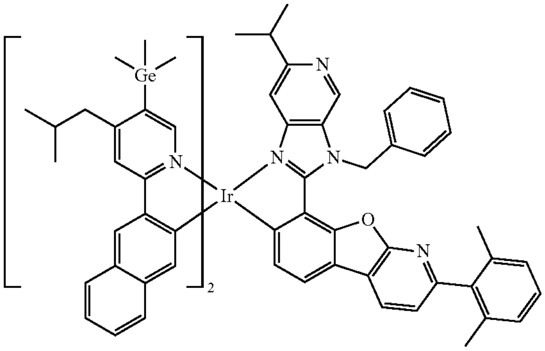
-continued
2358
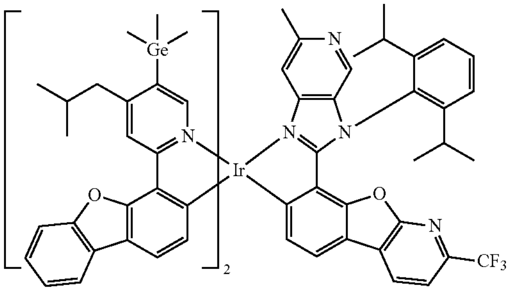
2359
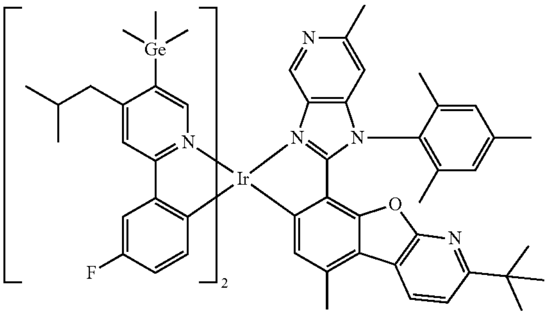
2360
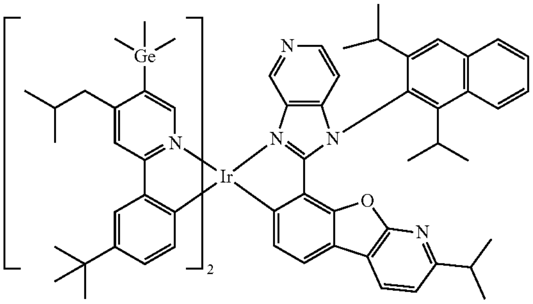
2361
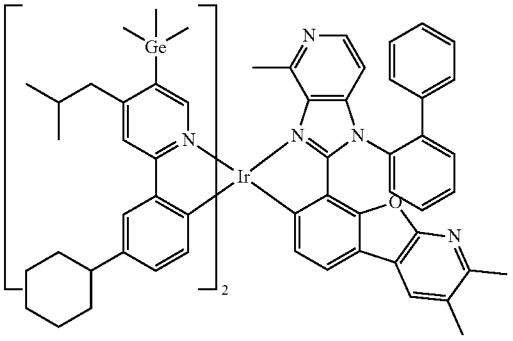

-continued
2362
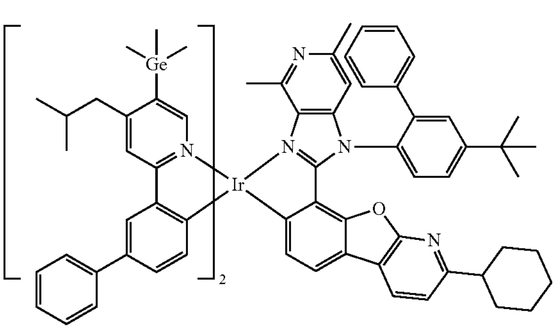
2363
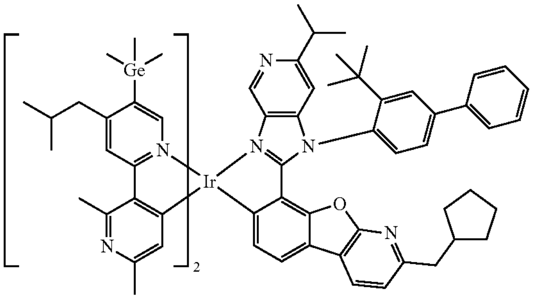
2364
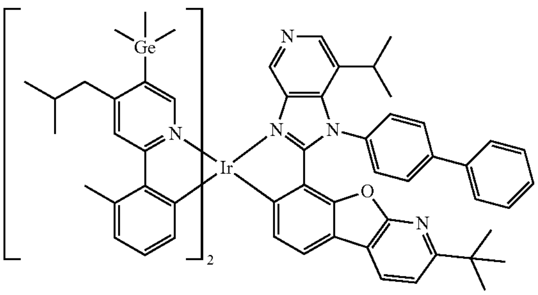
2365
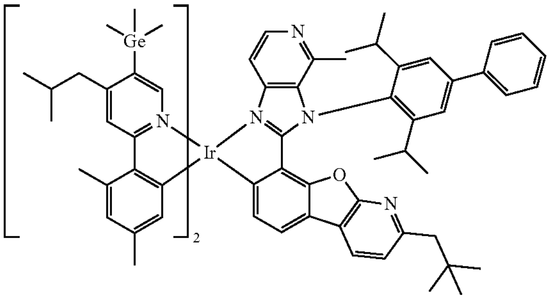
2366
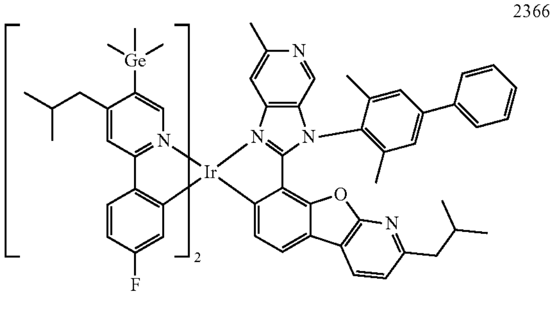
-continued
2367
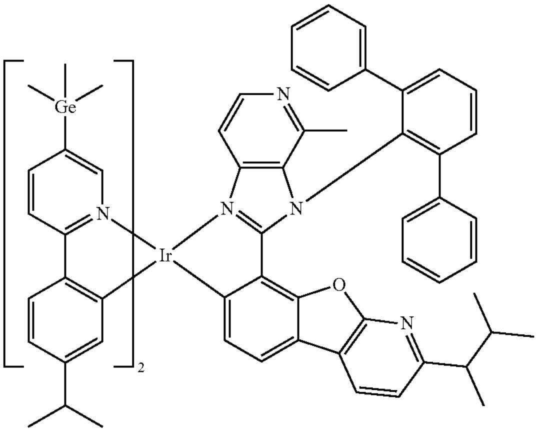
2368
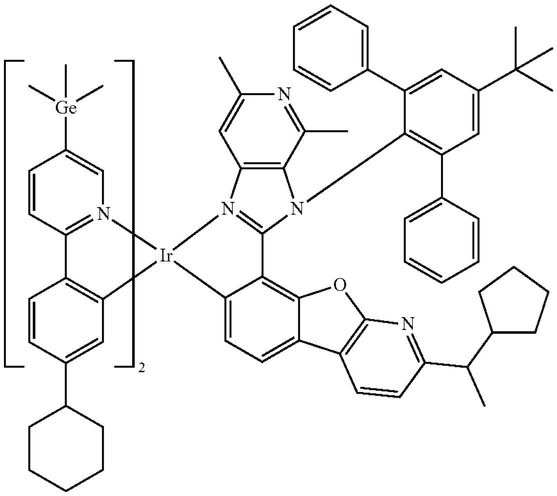
2369
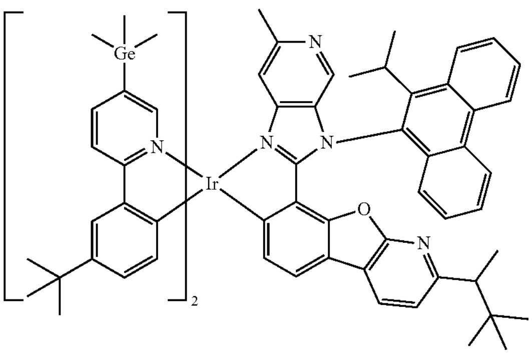

-continued
2370
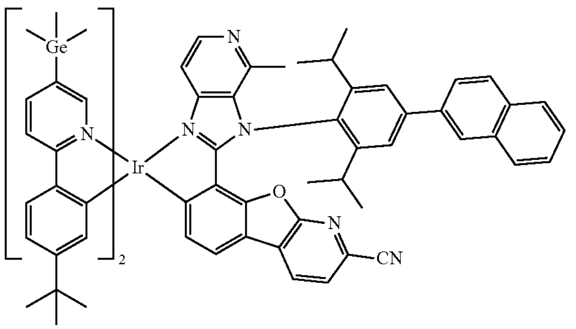
2371
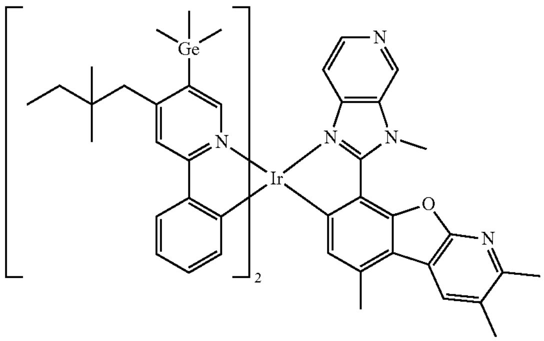
2372
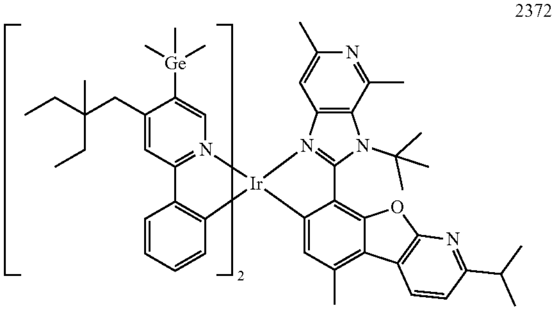
2373
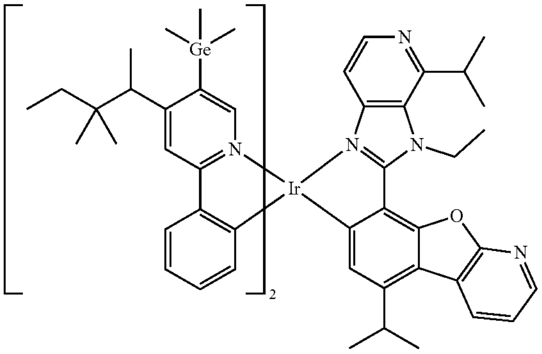
-continued
2374
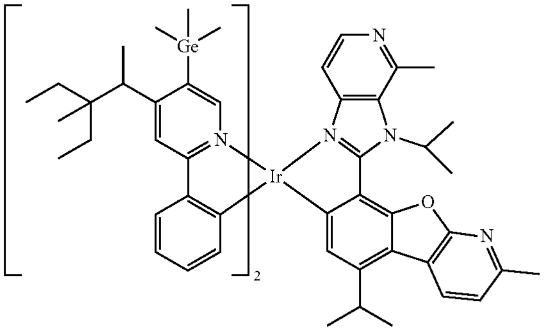
2375
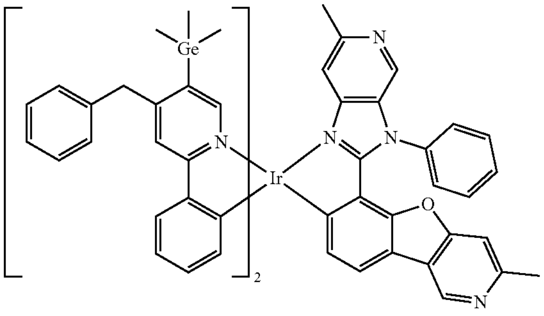
2376
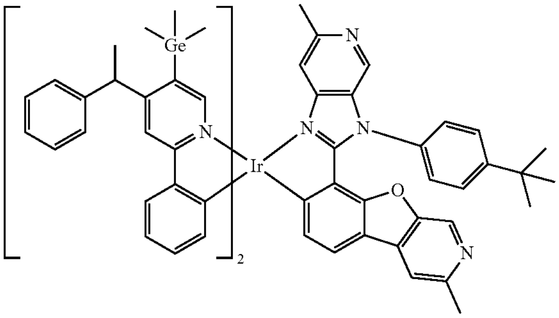
2377
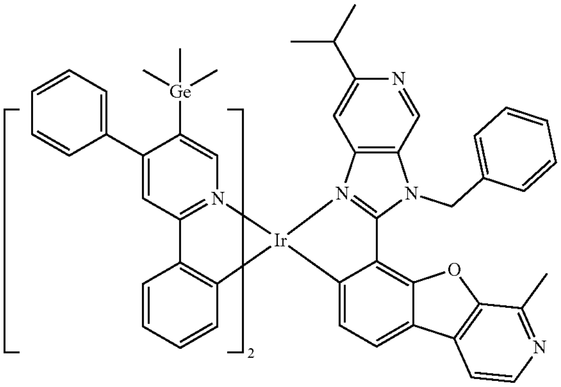

-continued
2378
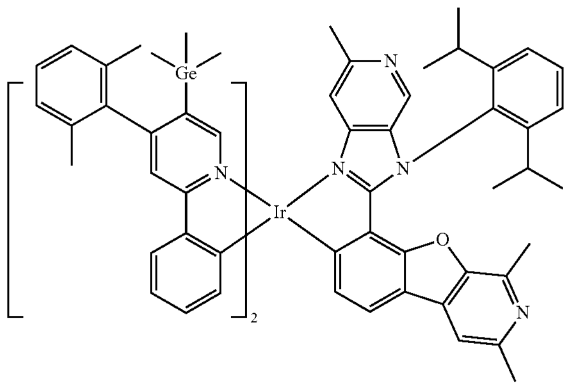
2379
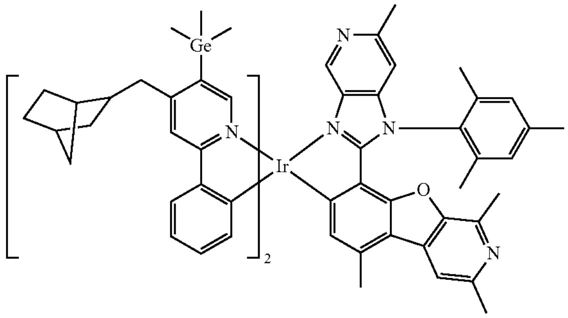
2380
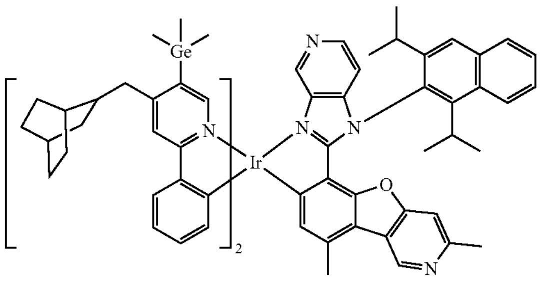
2381
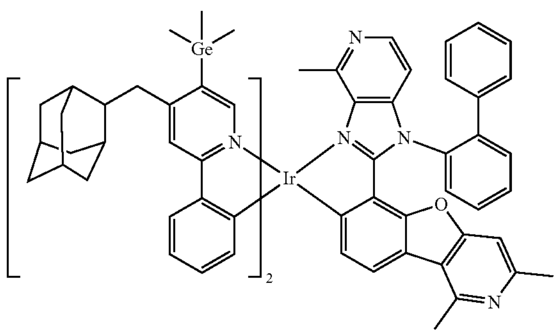
-continued
2382
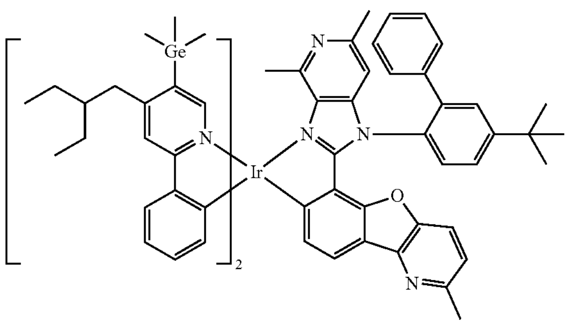
2383
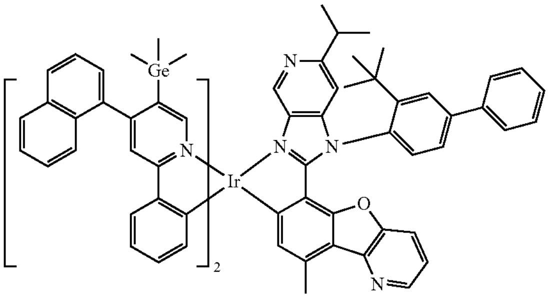
2384
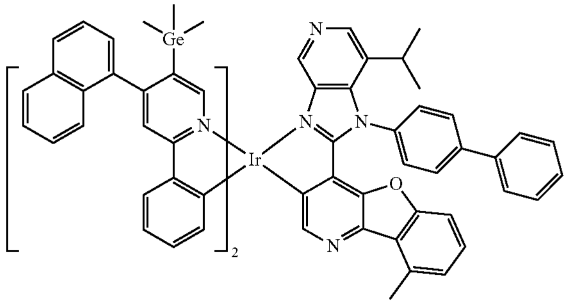
2385
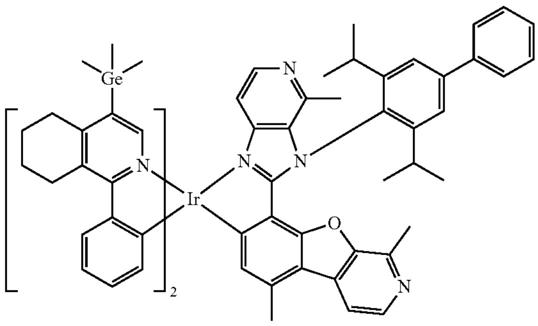
2386
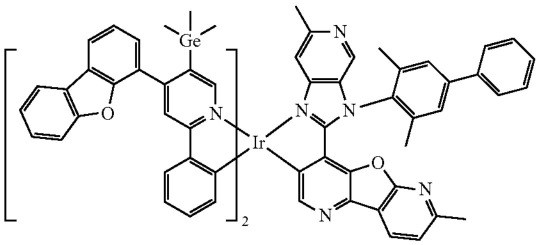

-continued
2387
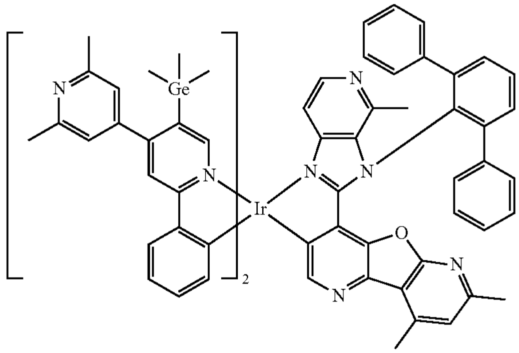
2388
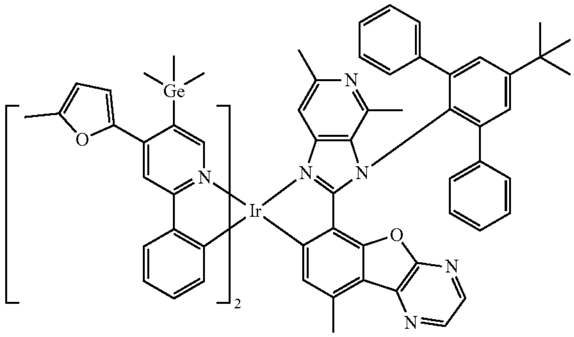
2389
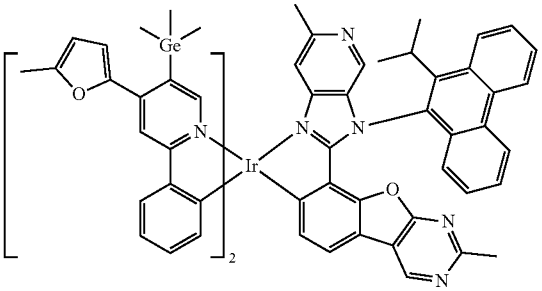
2390
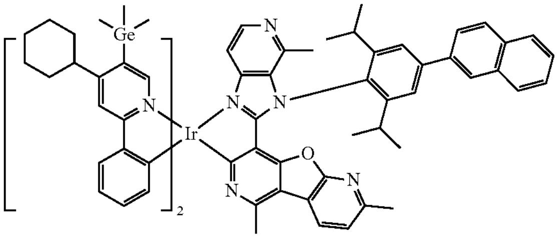
-continued
2391
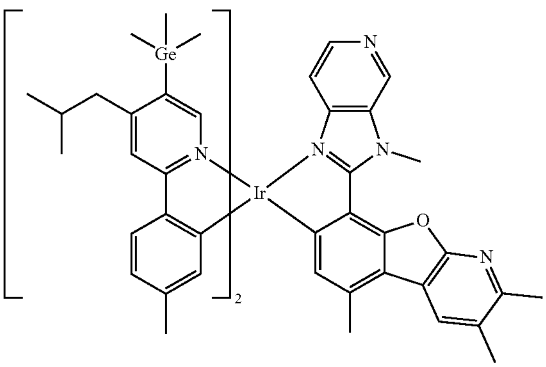
2392
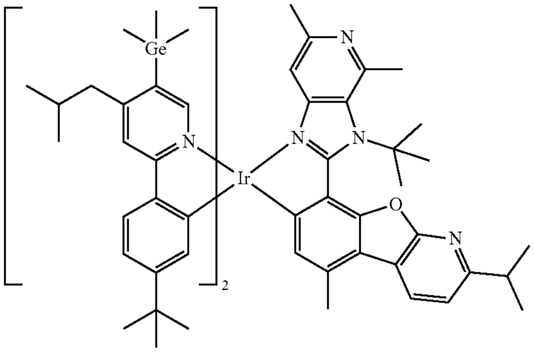
2393
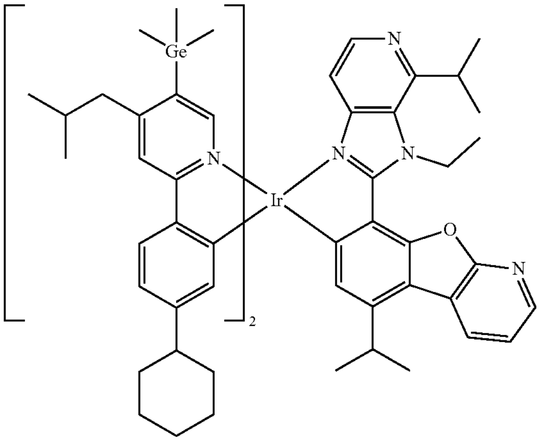
2394
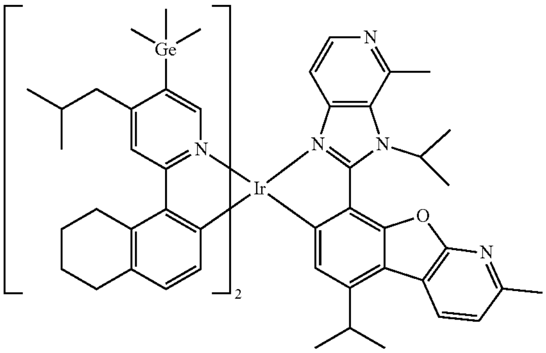

-continued
2395
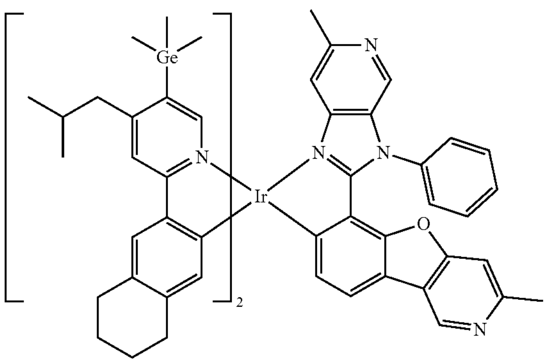
2396
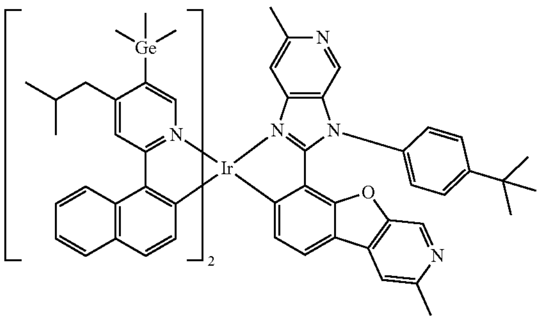
2397
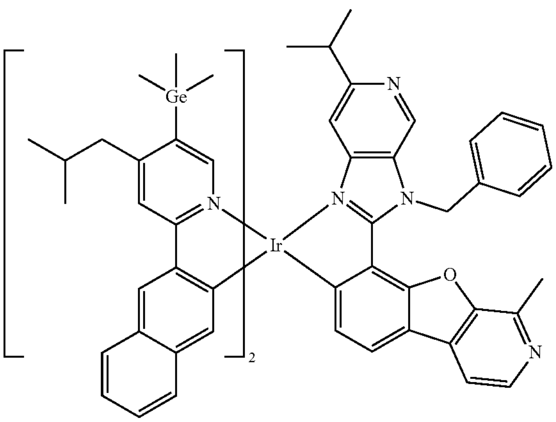
2398
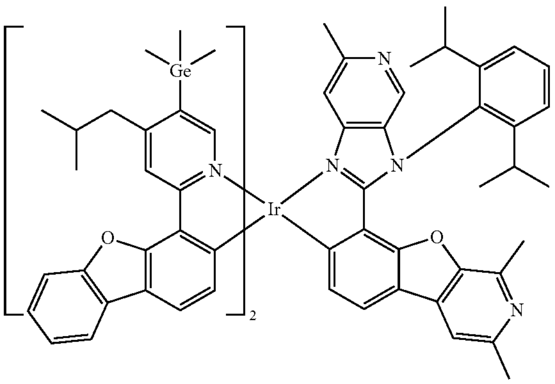
-continued
2399
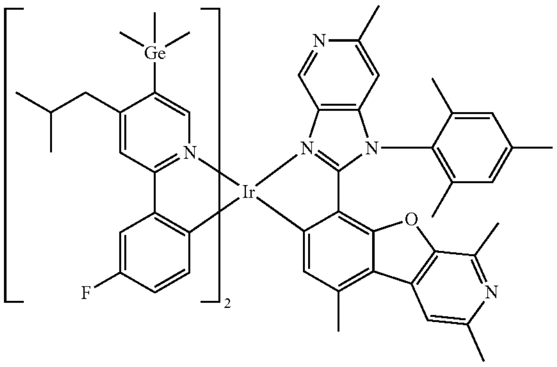
2400
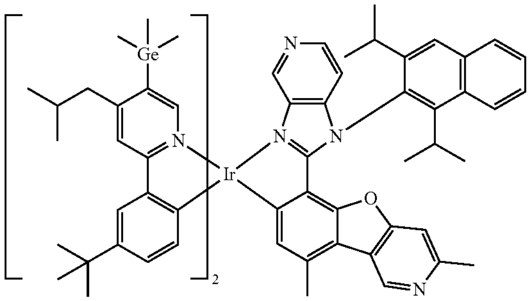
2401
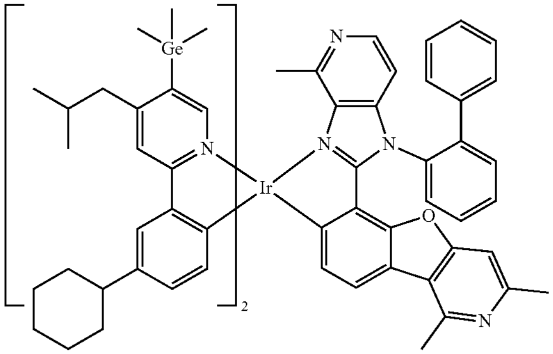
2402
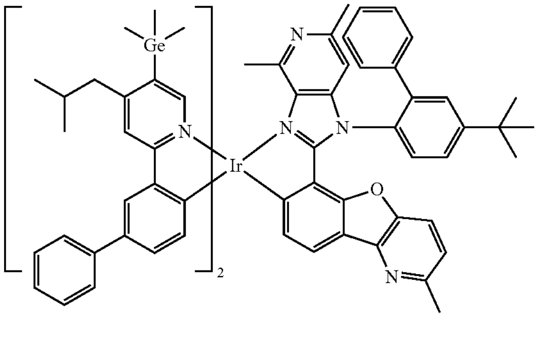

-continued
2403
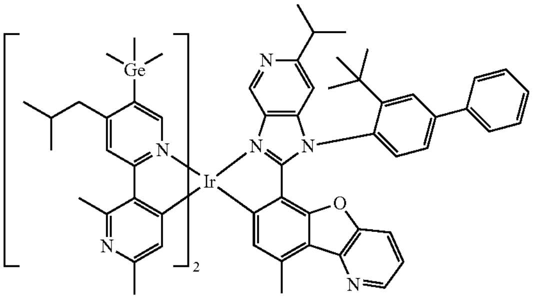
2404
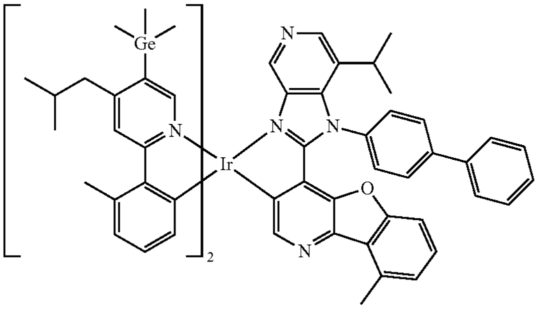
2405
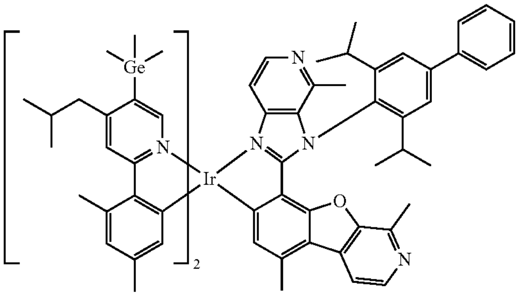
2406
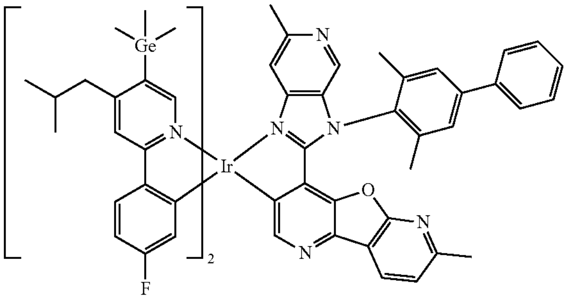
-continued
2407
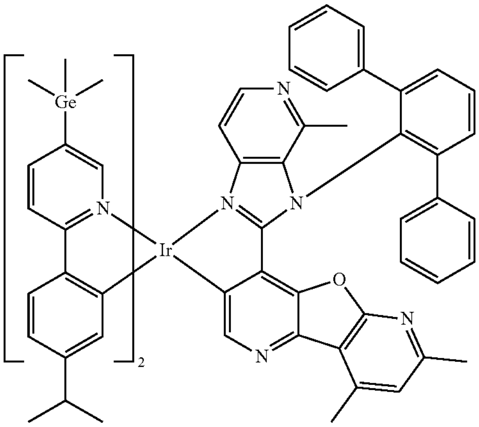
2408
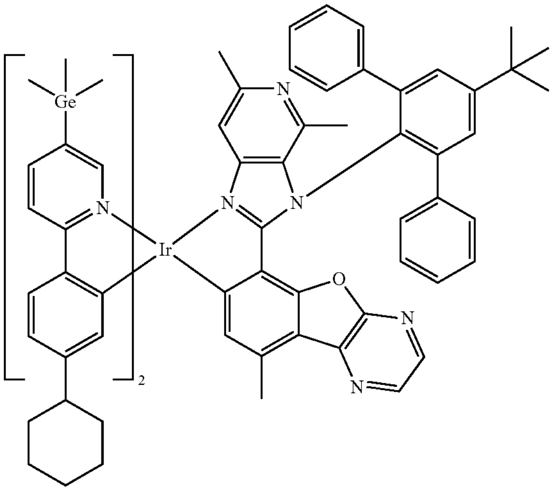
2409
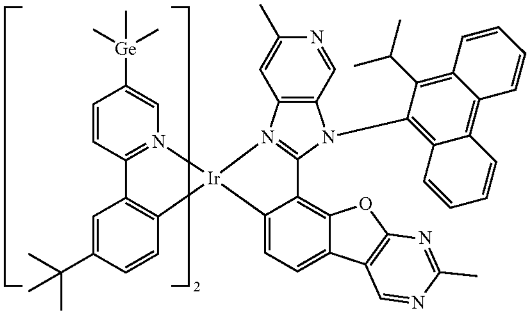
2410
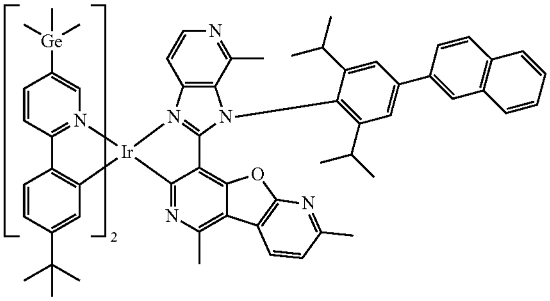

-continued
2411
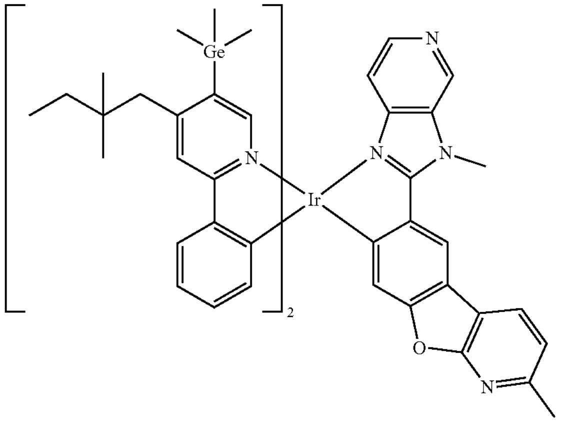
2412
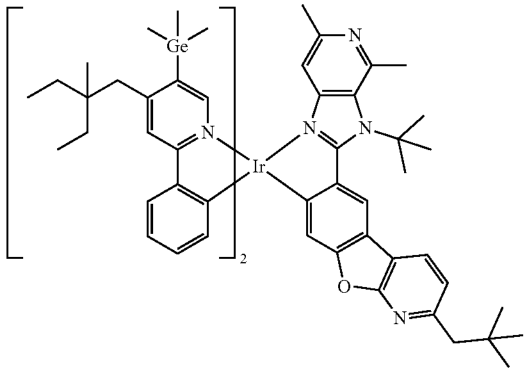
2413
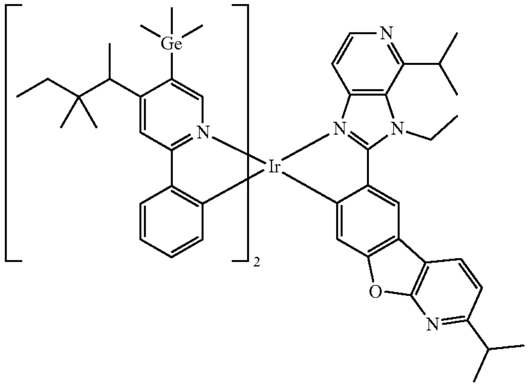
2414
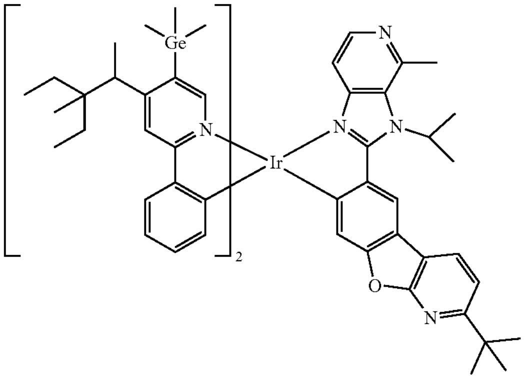
2415
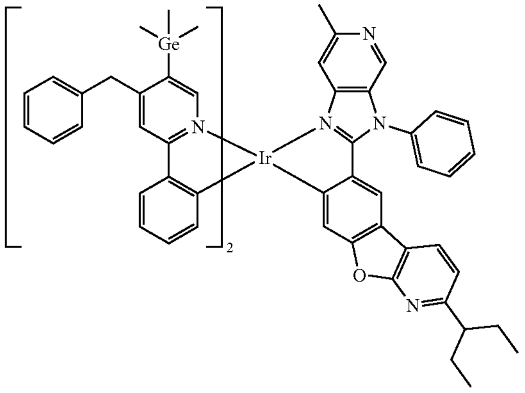
2416
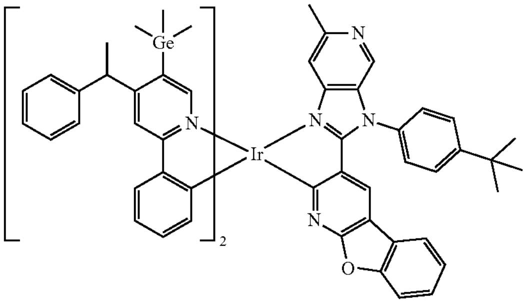

-continued
2417
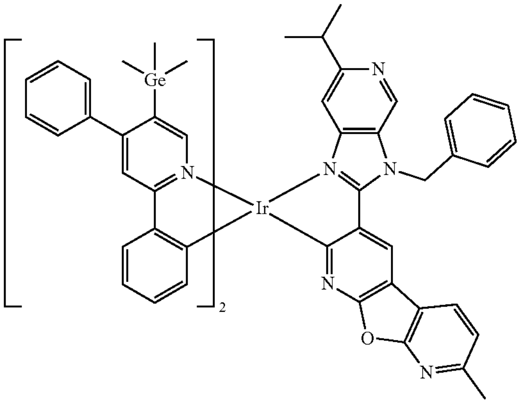
2418
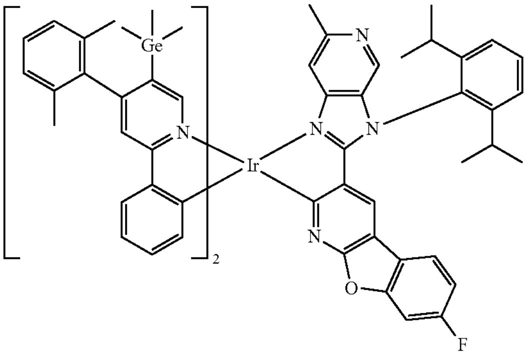
2419
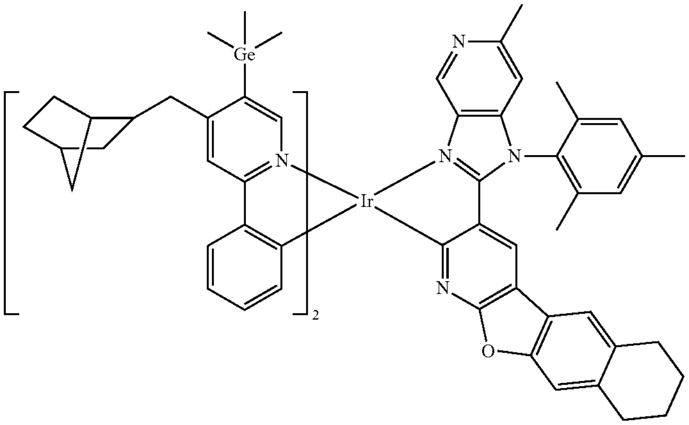
2420
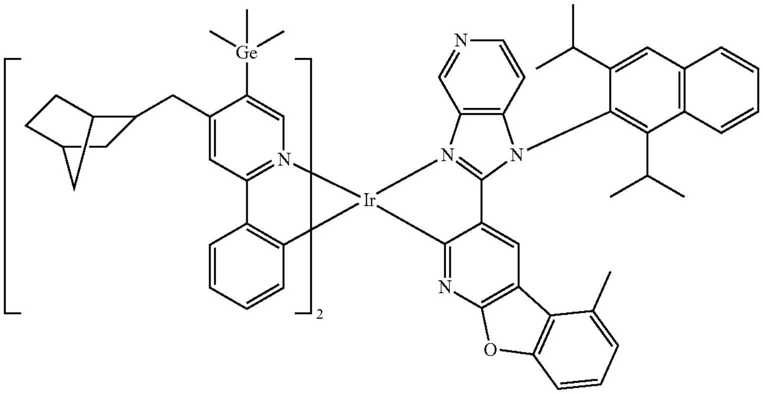

-continued
2421
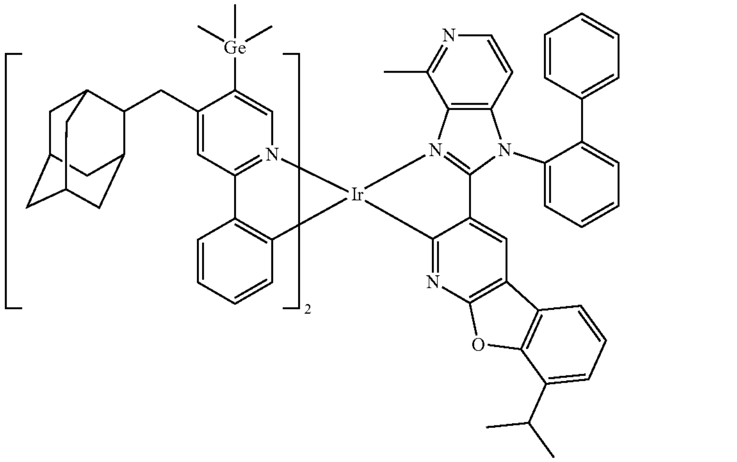
2422
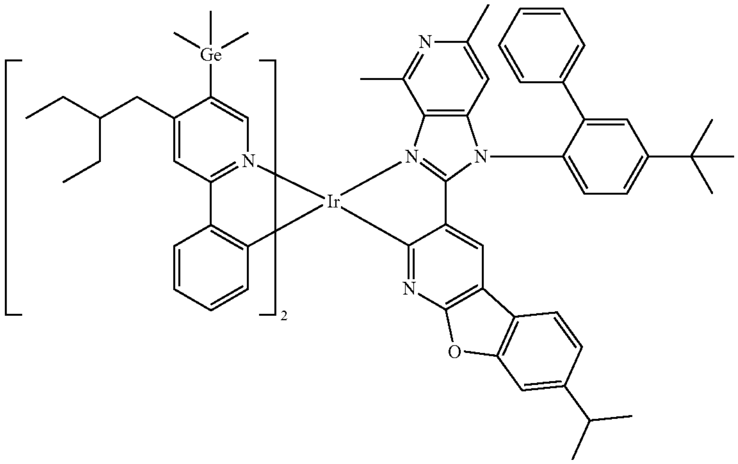
2423
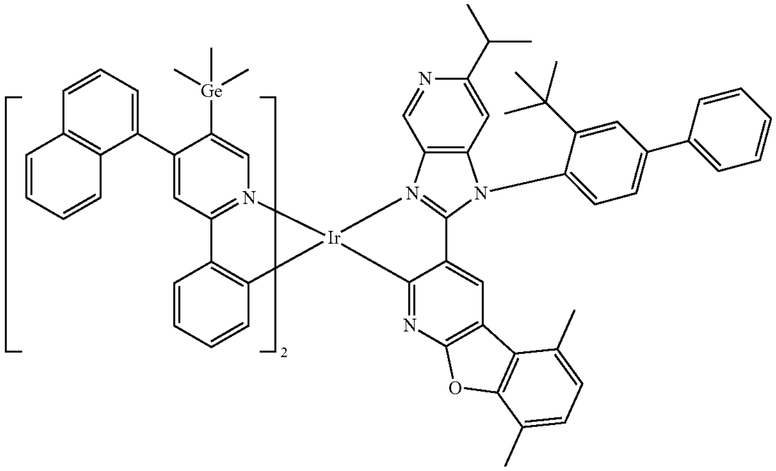

-continued
2424
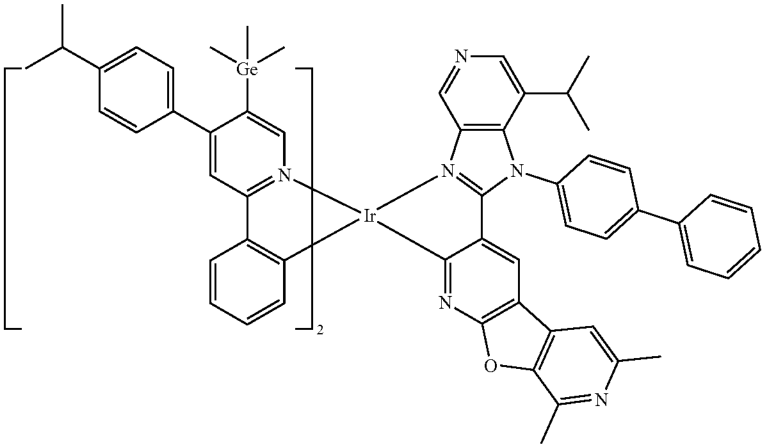
2425
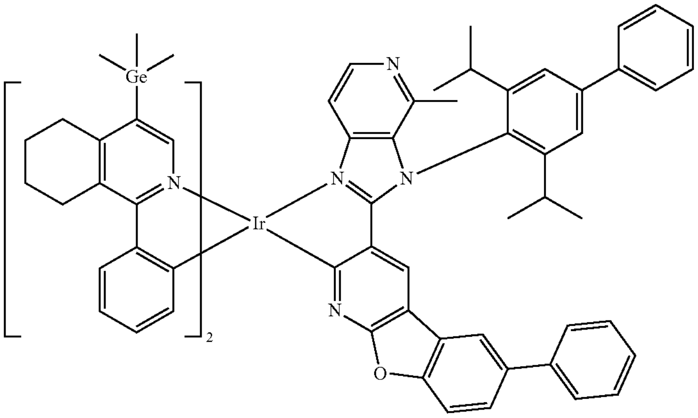
2426
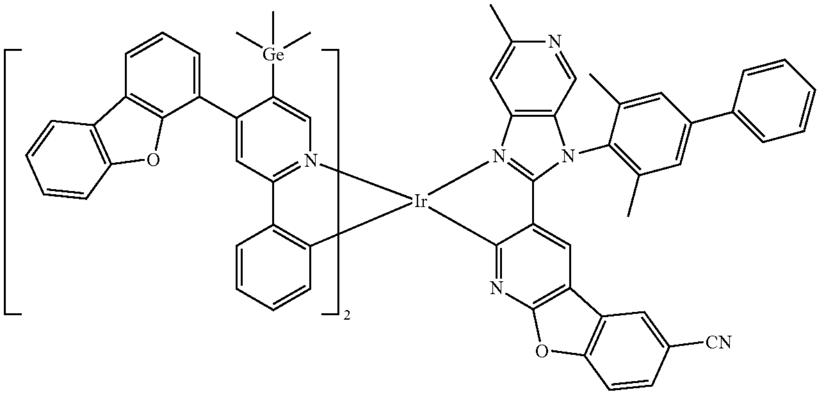

-continued
2427
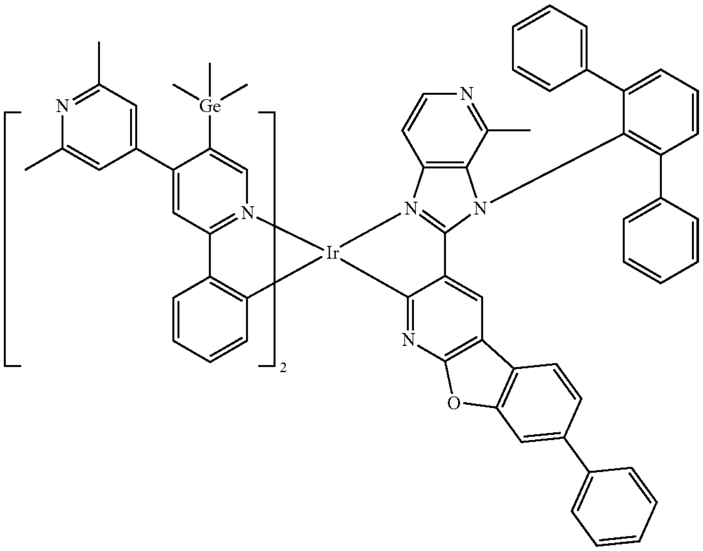
2428
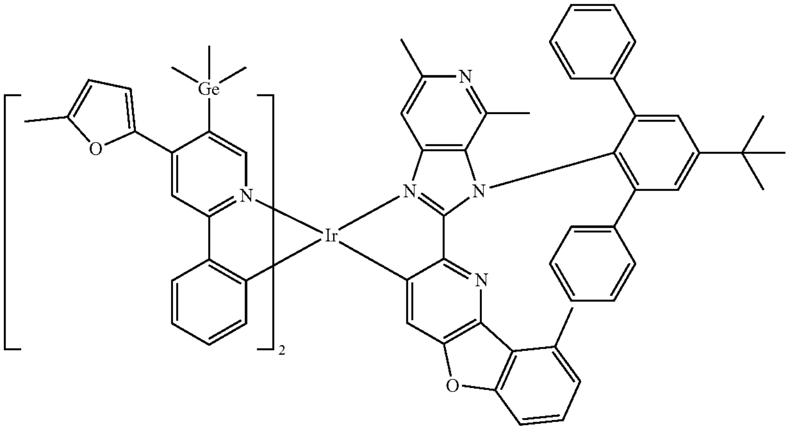
2429
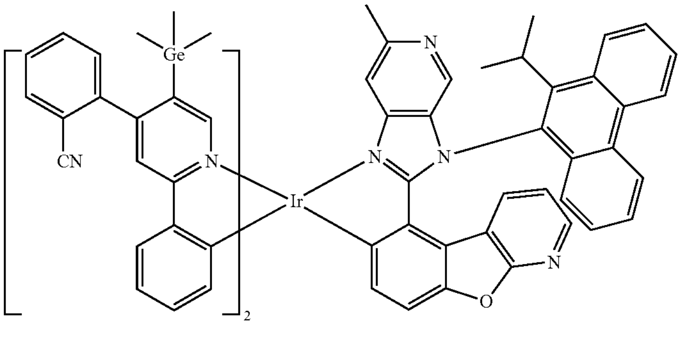
2430
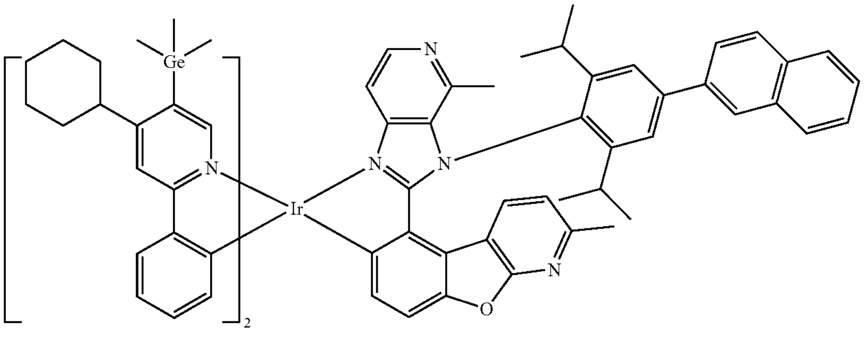

-continued
2431
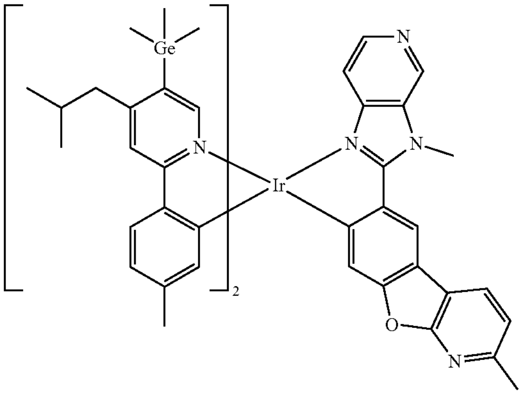
2432
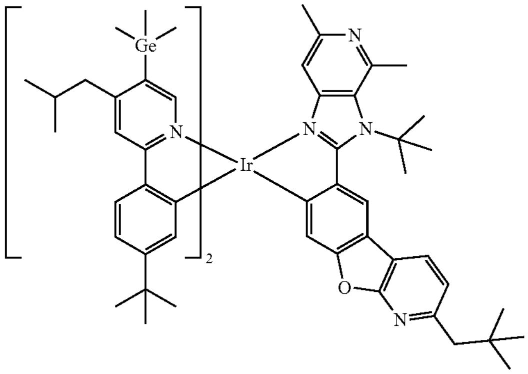
2433
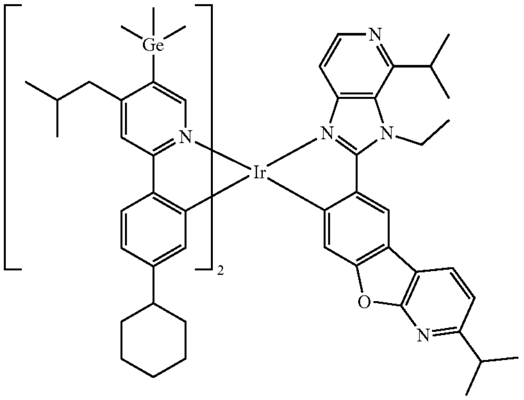
2434
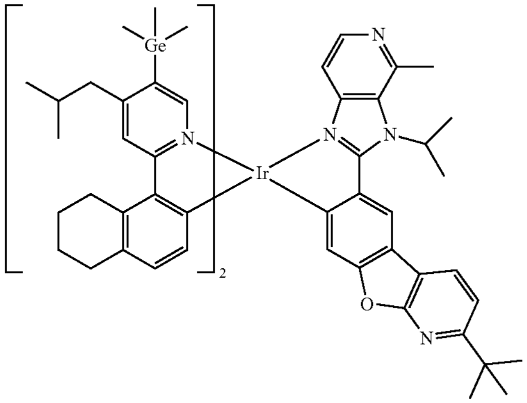
2435
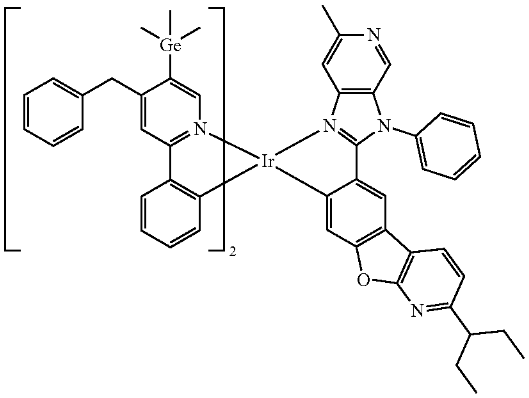
2436
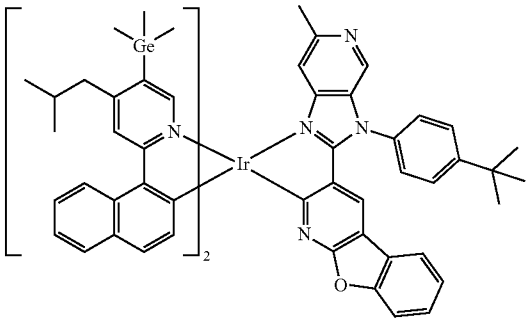

-continued
2437
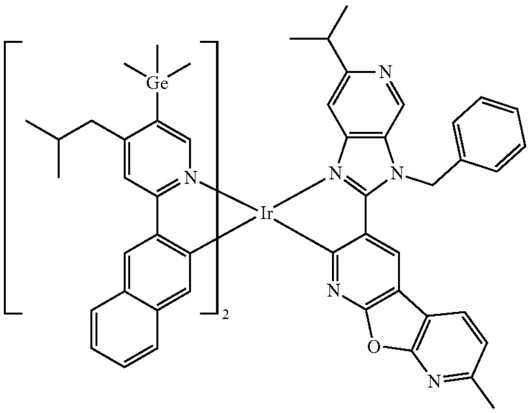
2438
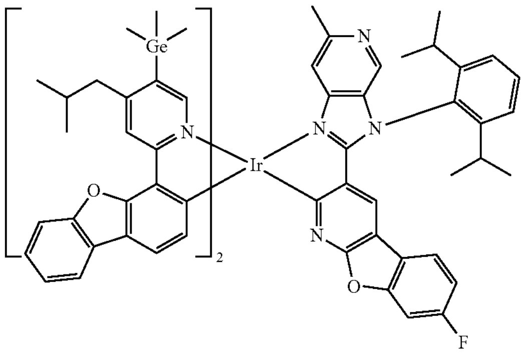
2439
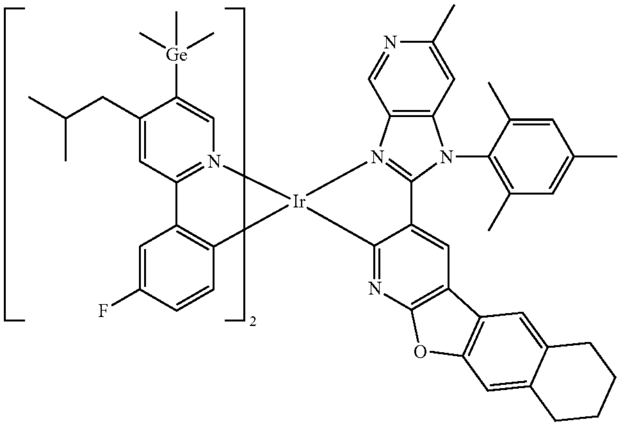
2440
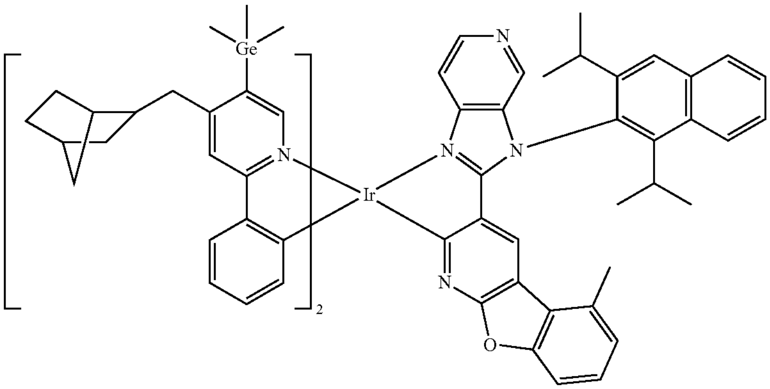

-continued
2441
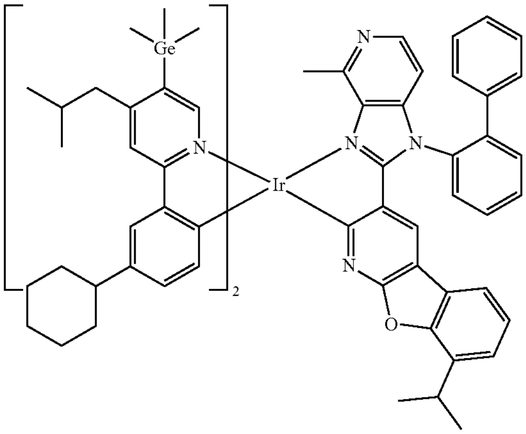
2442
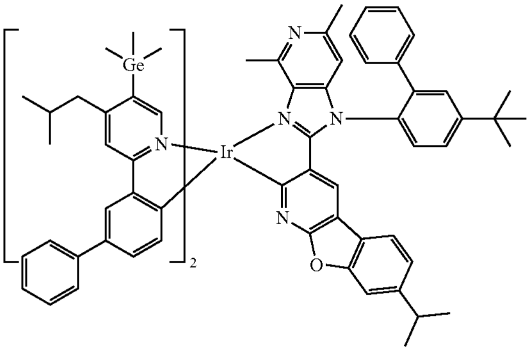
2443
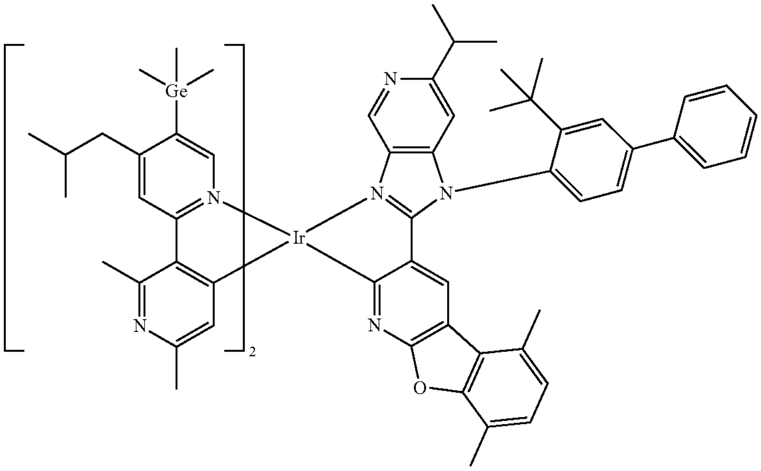
2444
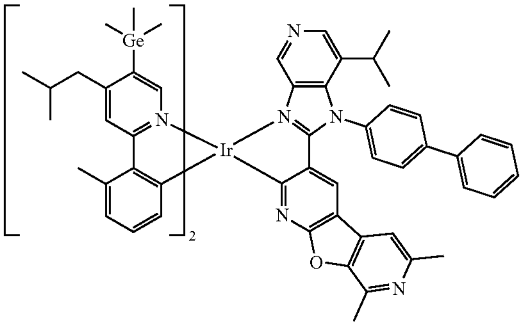
2445
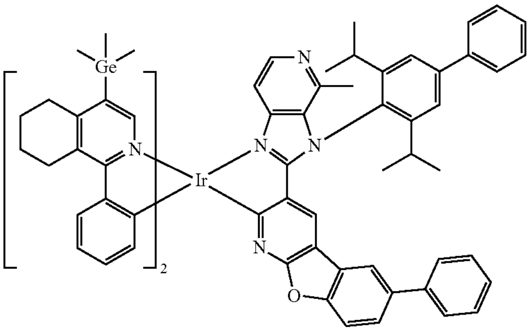

-continued
2446
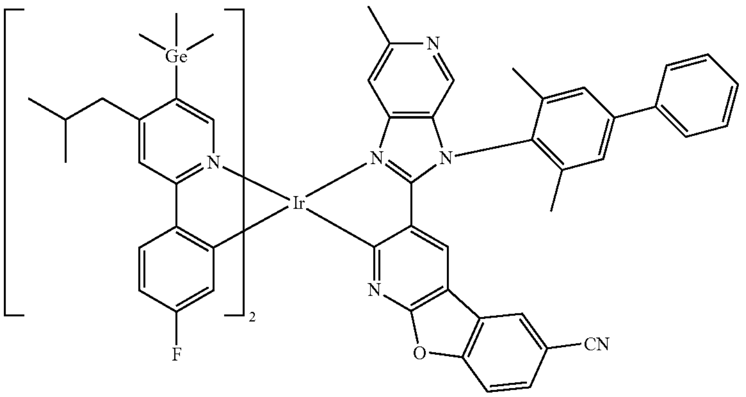
2447
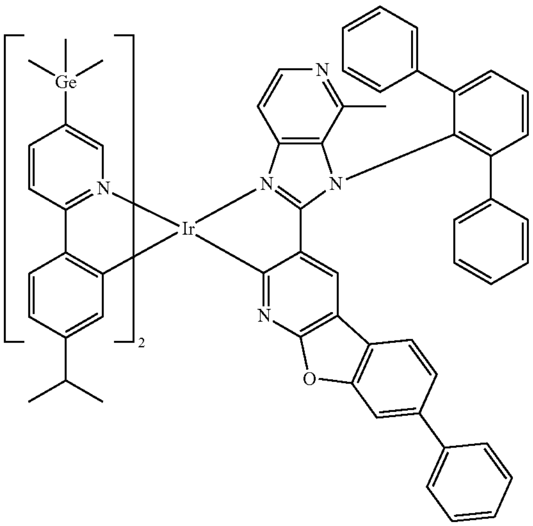
2448
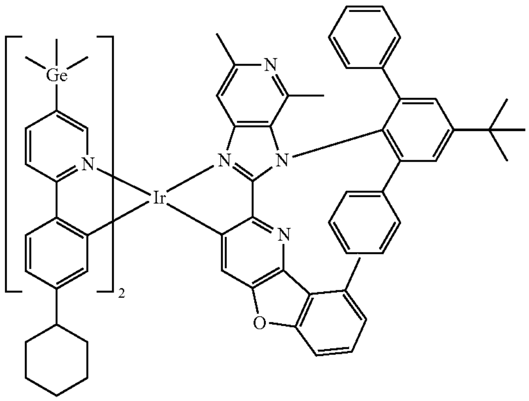
2449
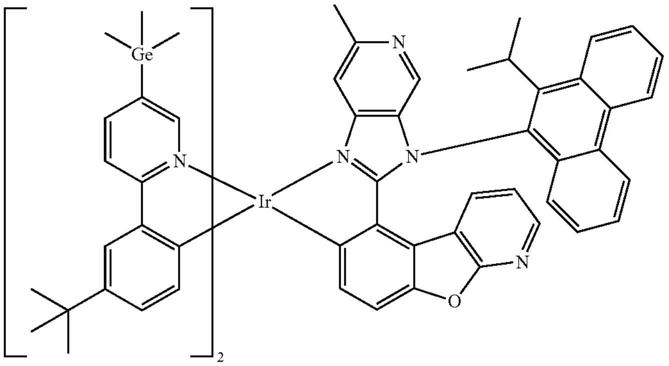
2450
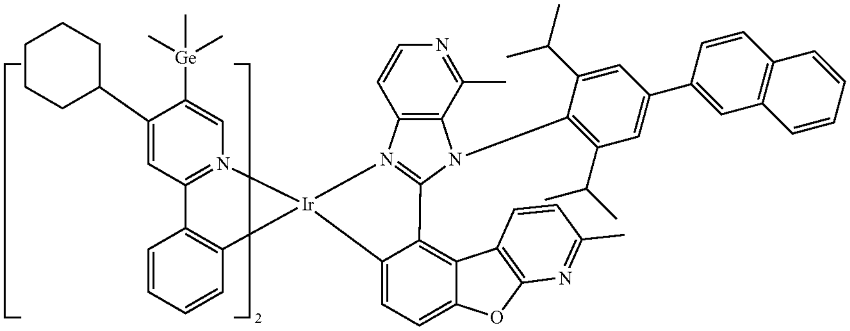

-continued
2451
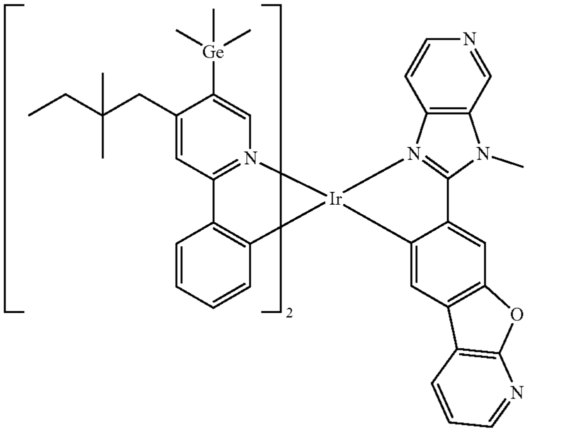
2452
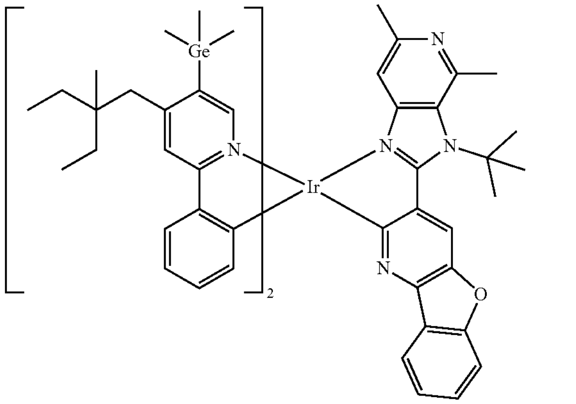
2453
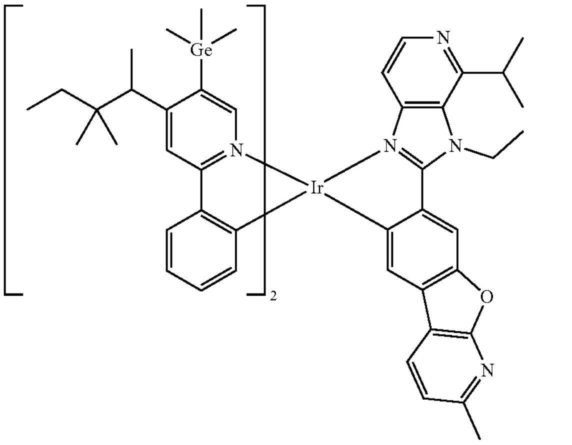
2454
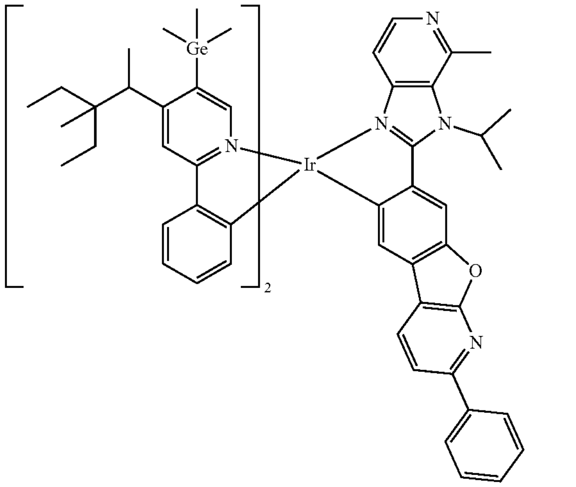
2455
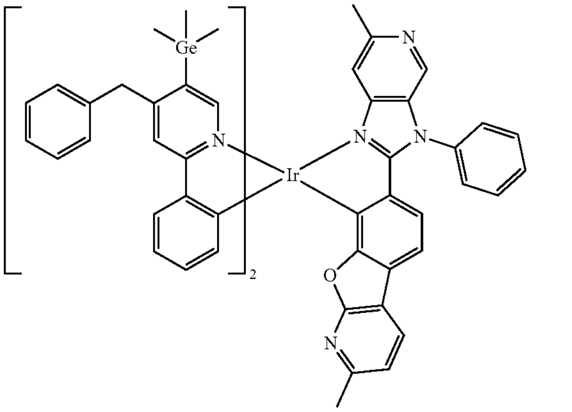
2456
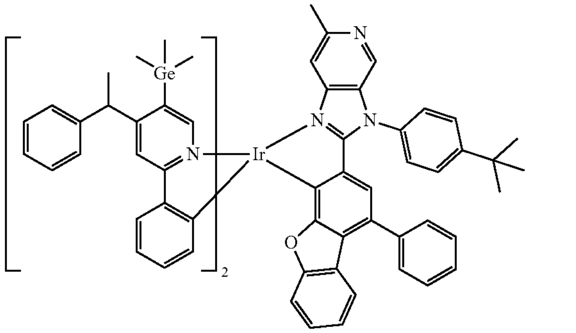

-continued
2457
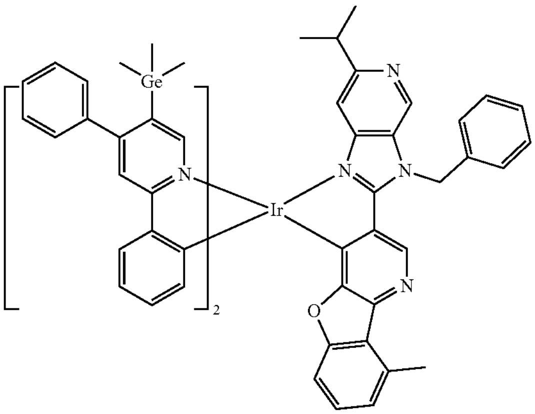
2458
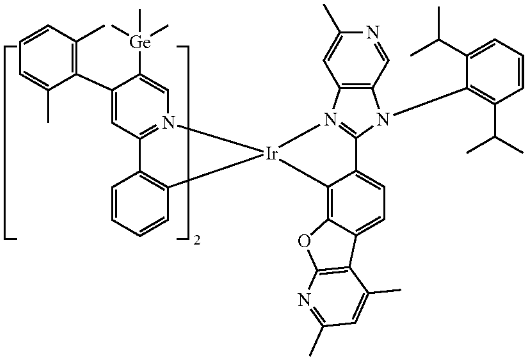
2459
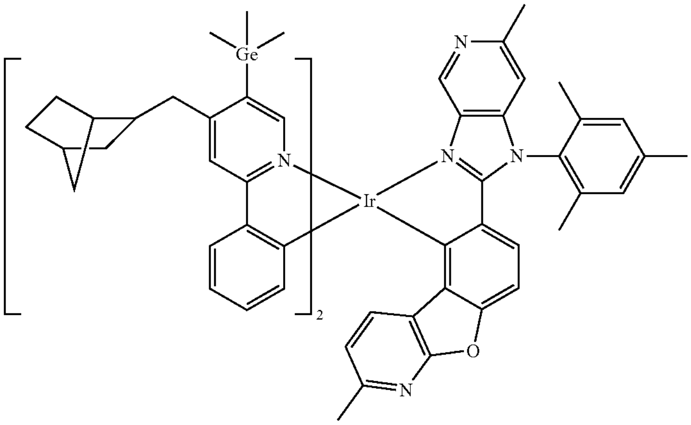
2460
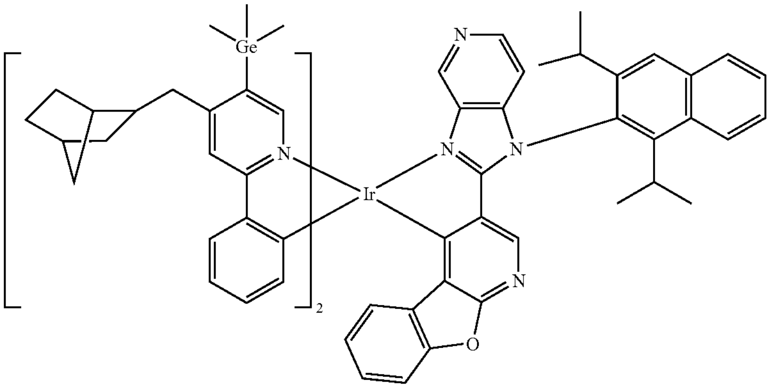

-continued
2461
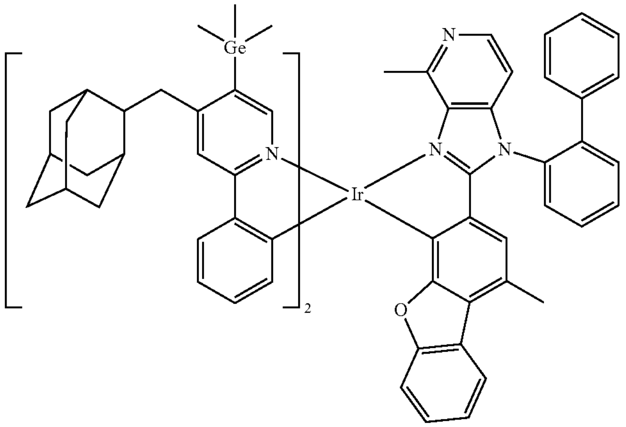
2462
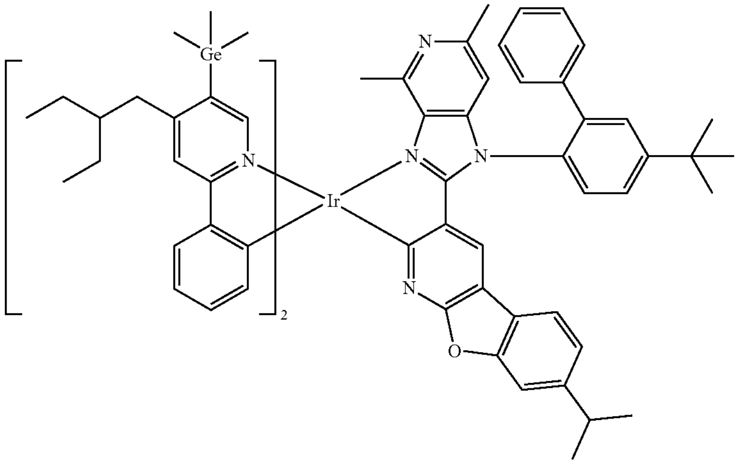
2463
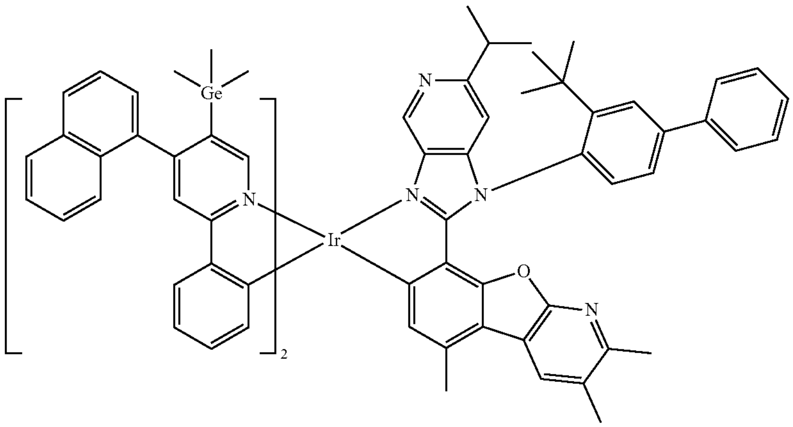

-continued
2464
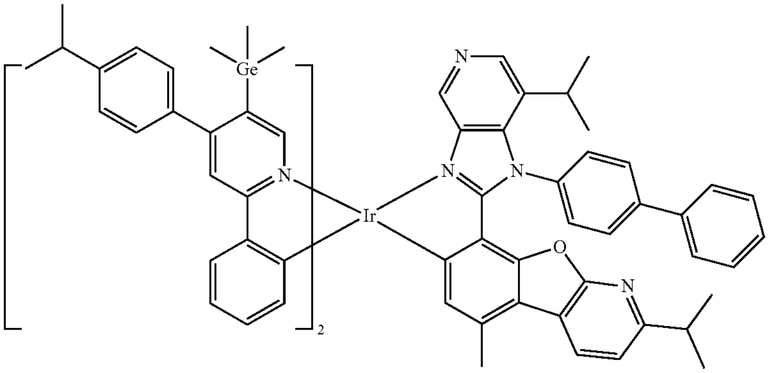
2465
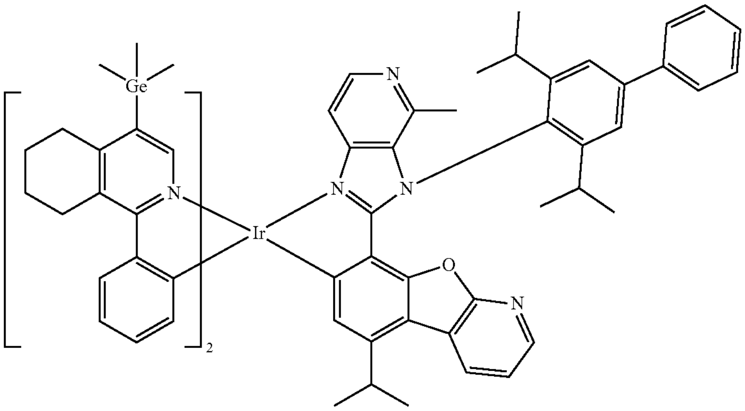
2466
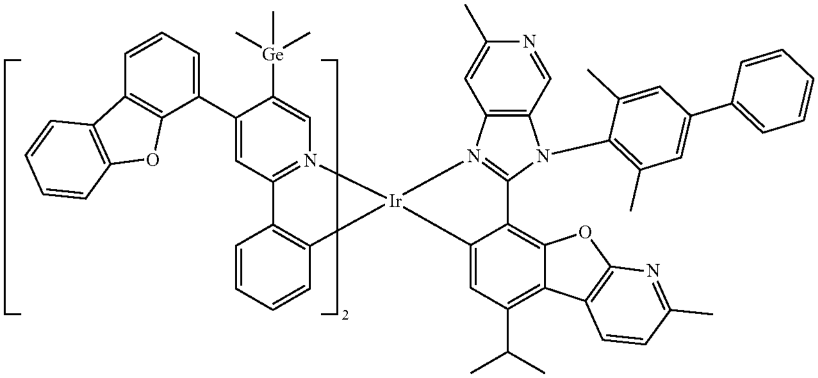
2467
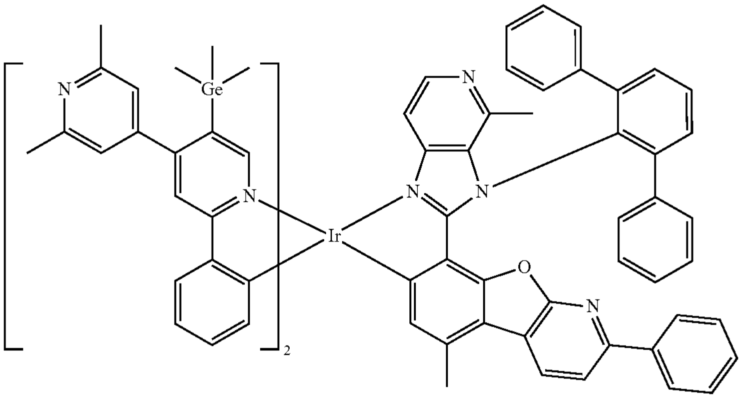

-continued
2468
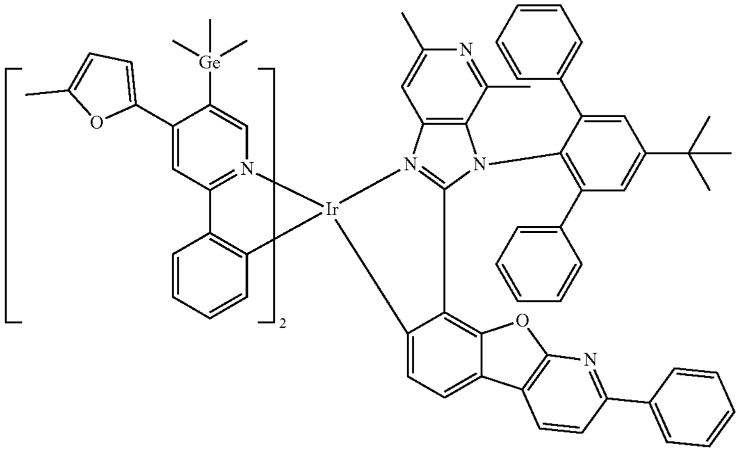
2469
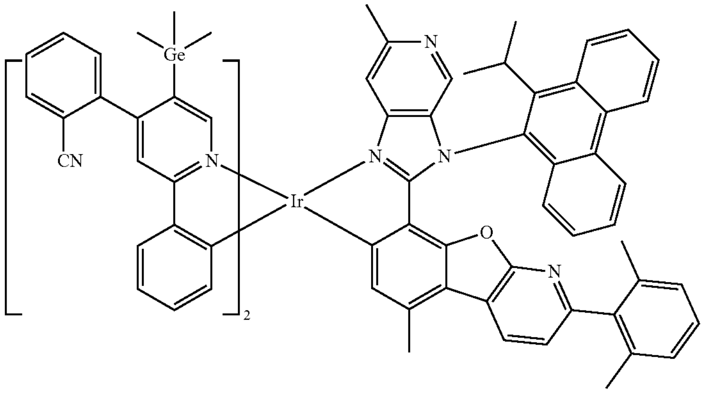
2470
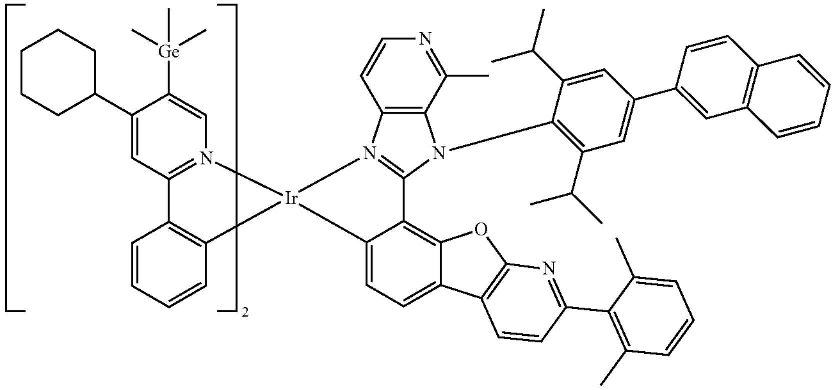
2471
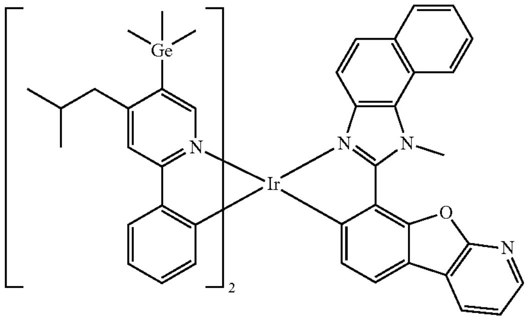
2472
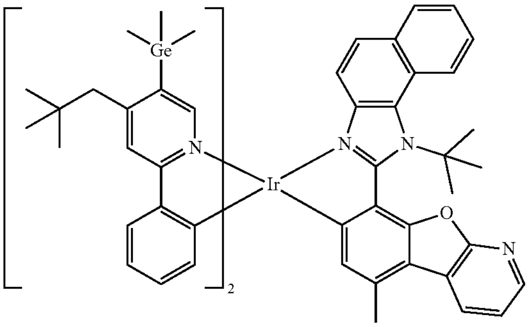

-continued
2473
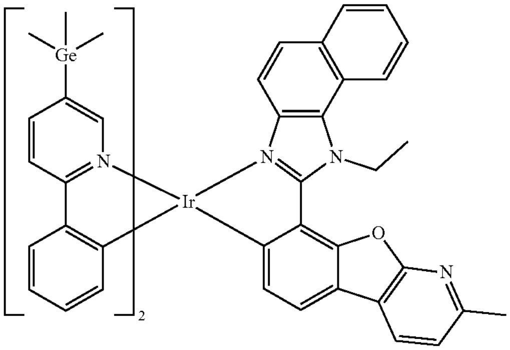
2474
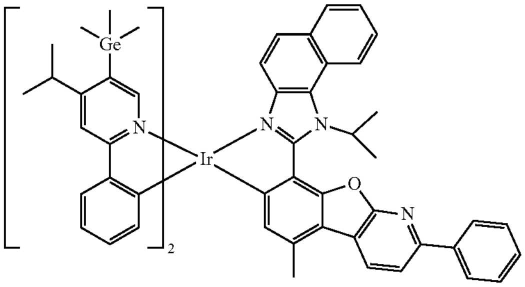
2475
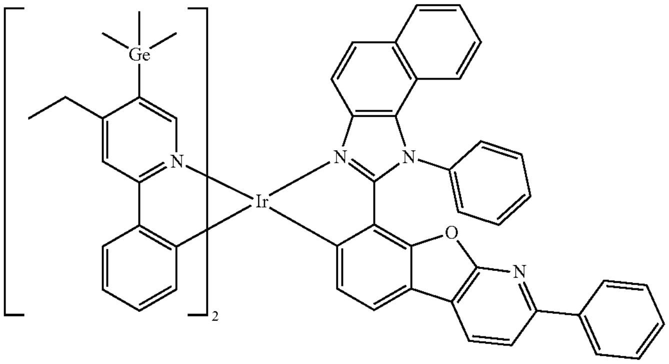
2476
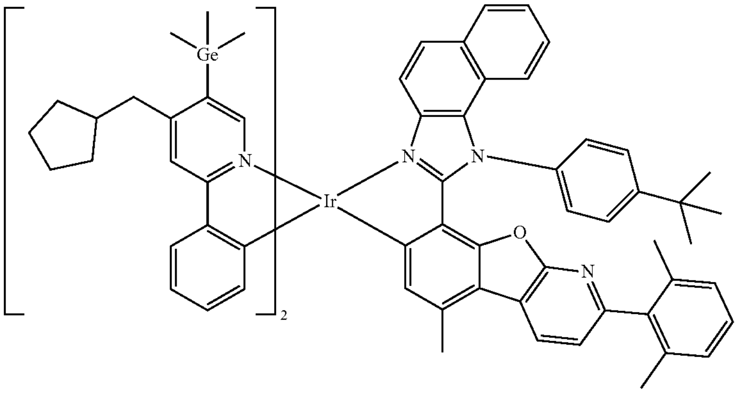
2477
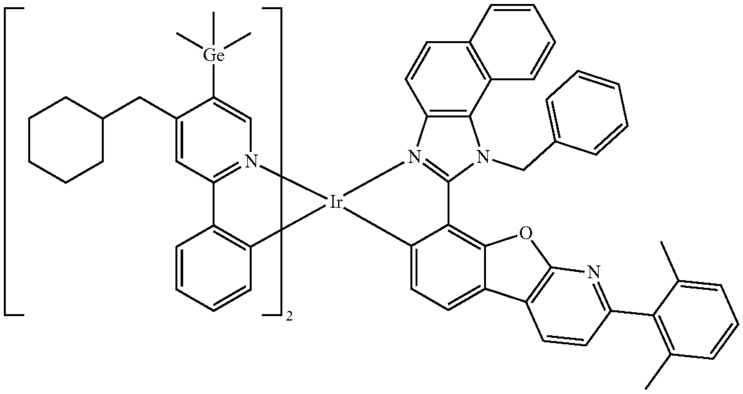

-continued
2478
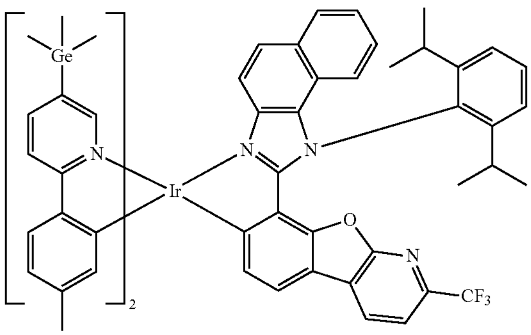
2479
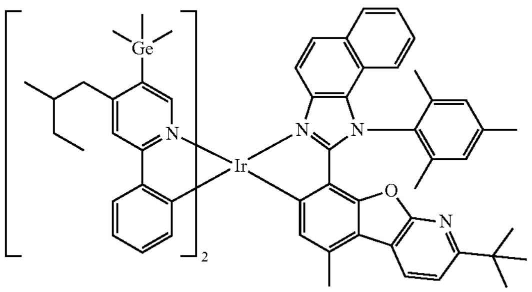
2480
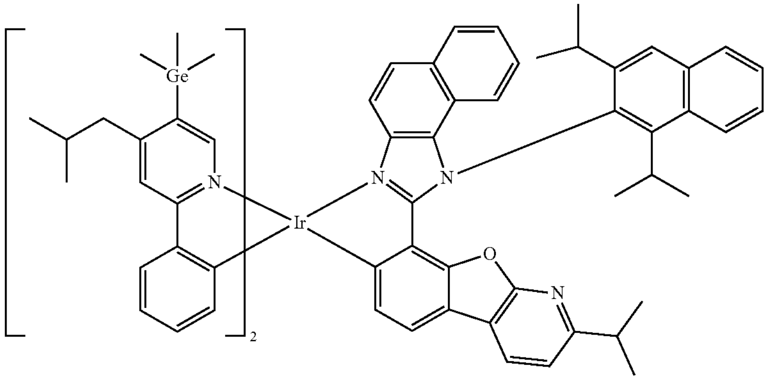
2481
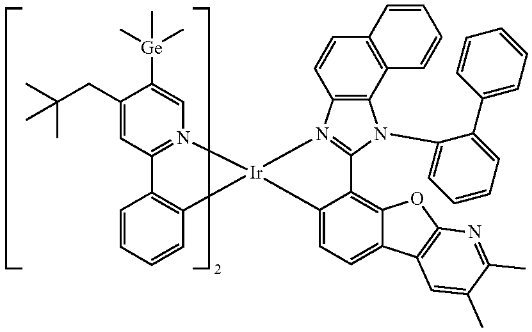
2482
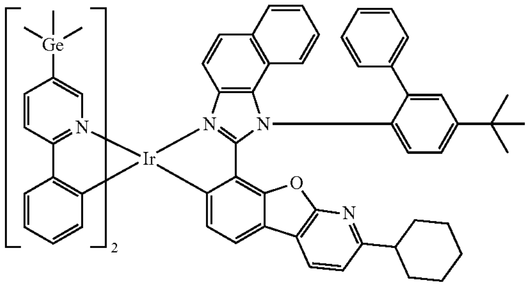
2483
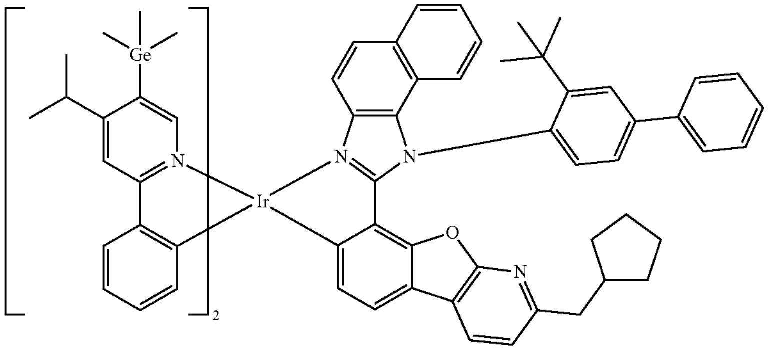

-continued
2484
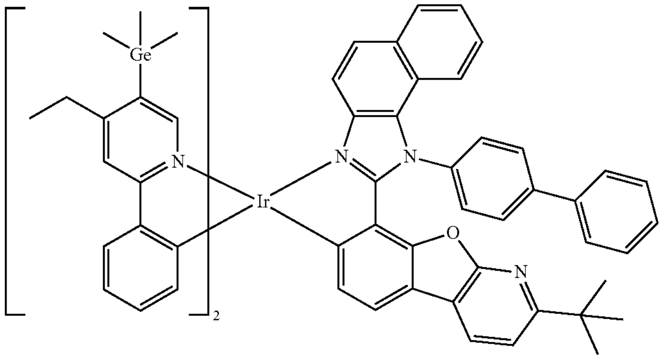
2485
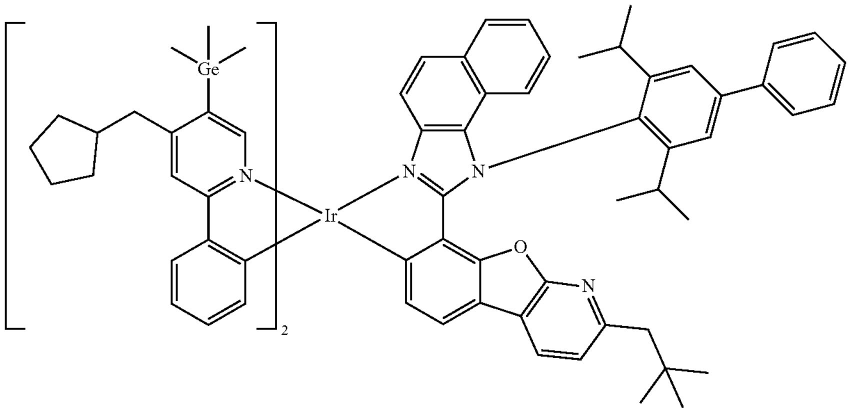
2486
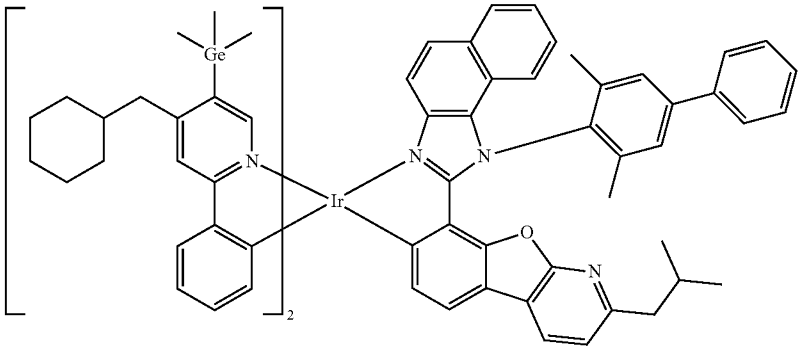
2487
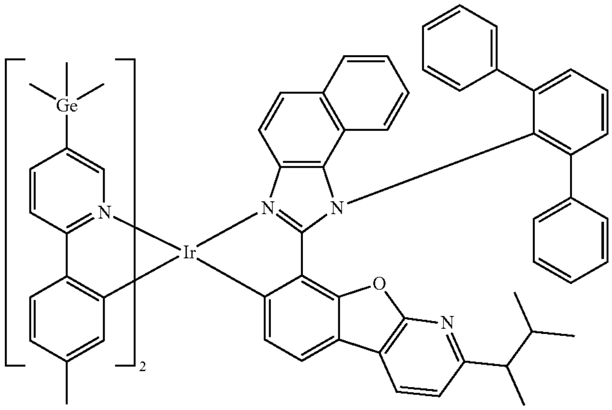

-continued
2488
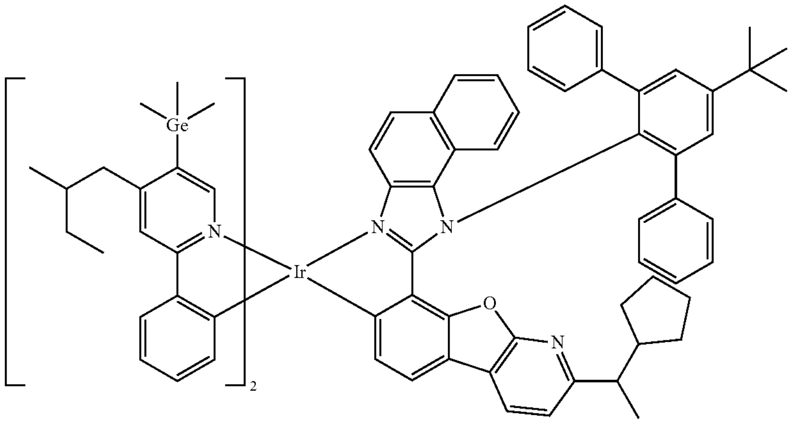
2489
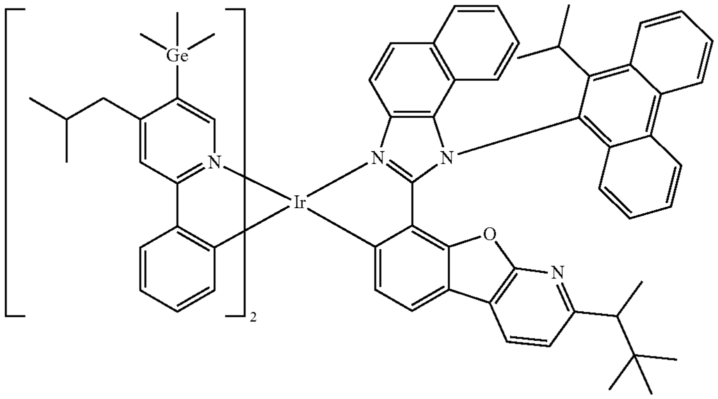
2490
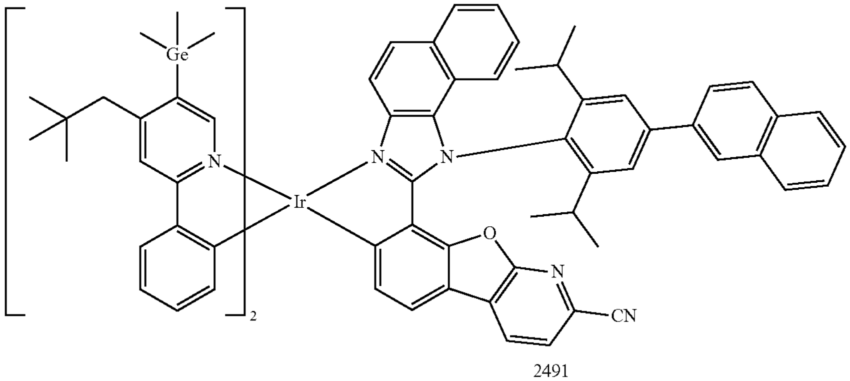
2491
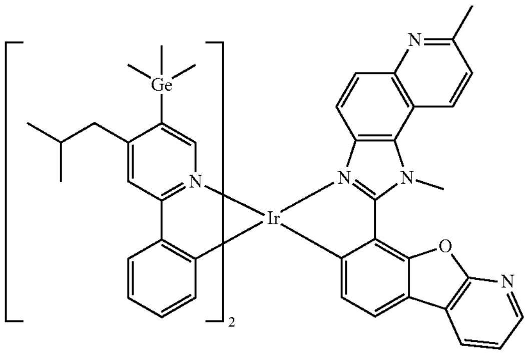
2492
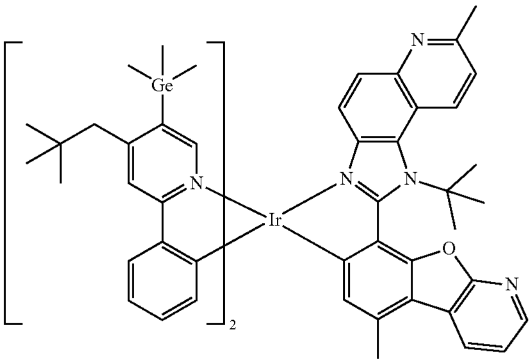

-continued
2493
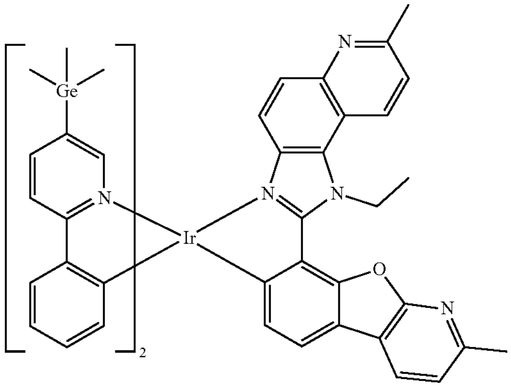
2494
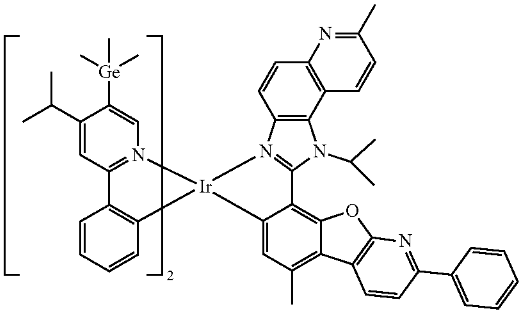
2495
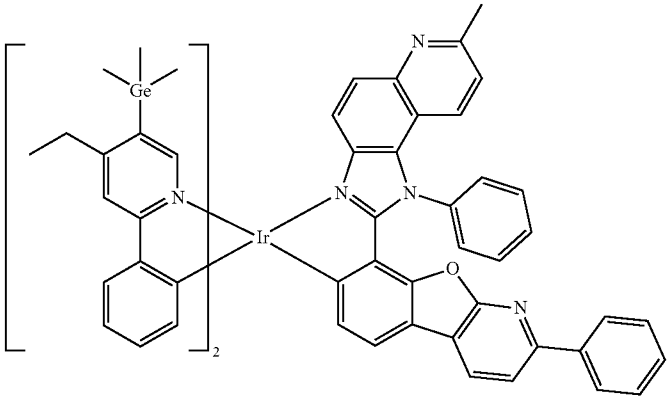
2496
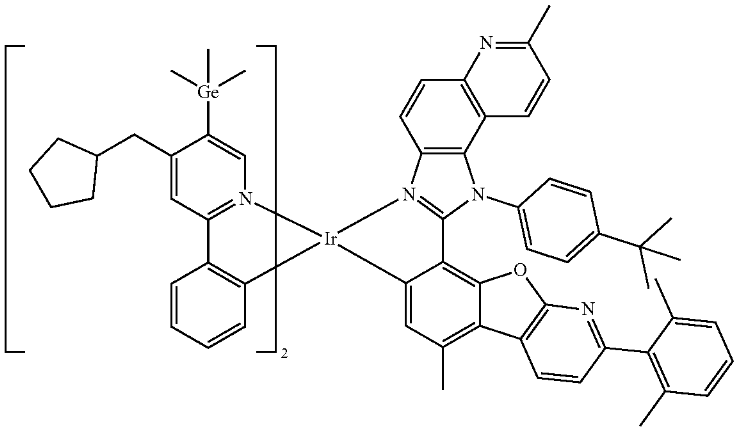

-continued
2497
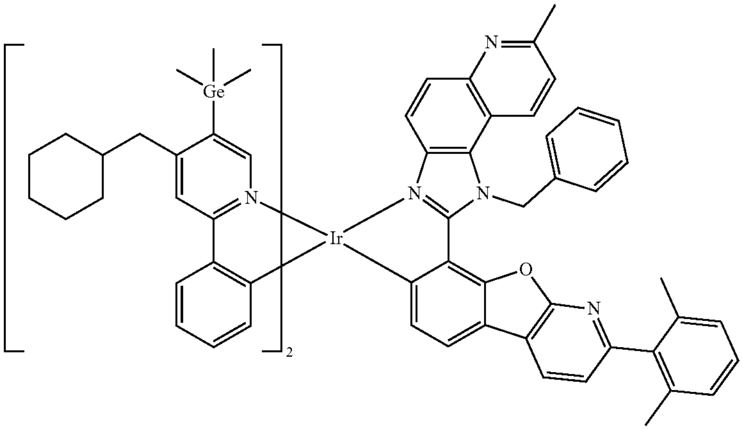
2498
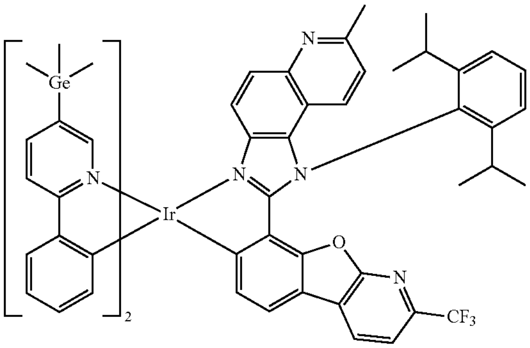
2499
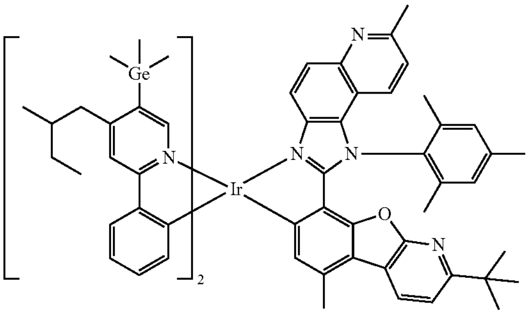
2500
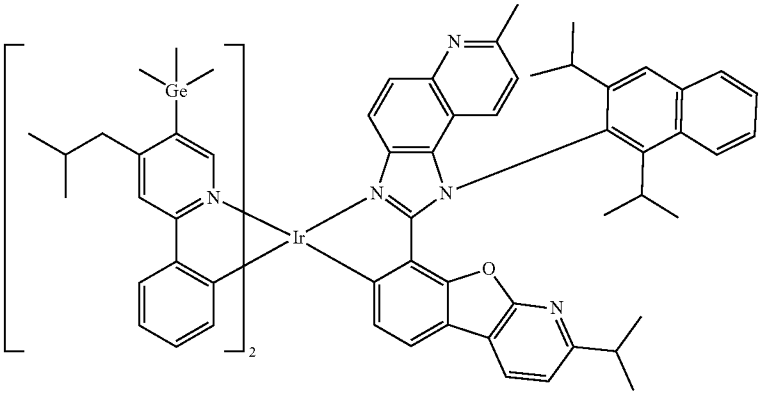
2501
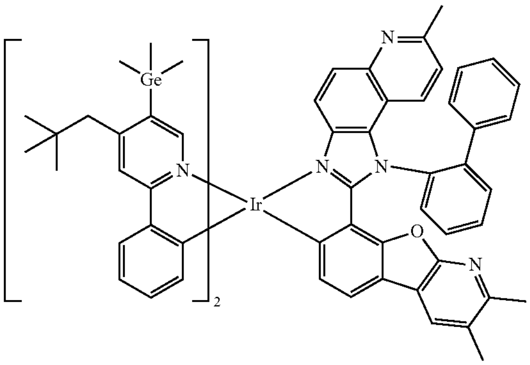
2502
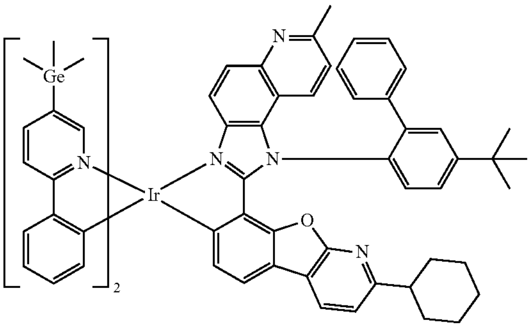

-continued
2503
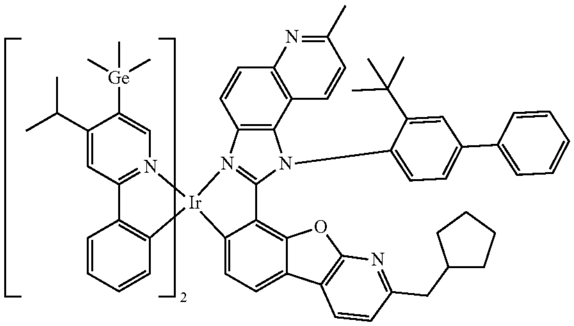
2504
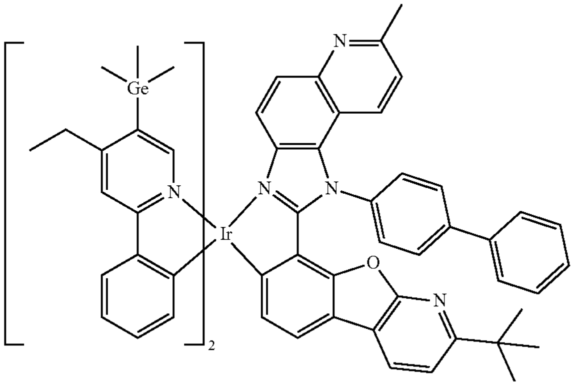
2505
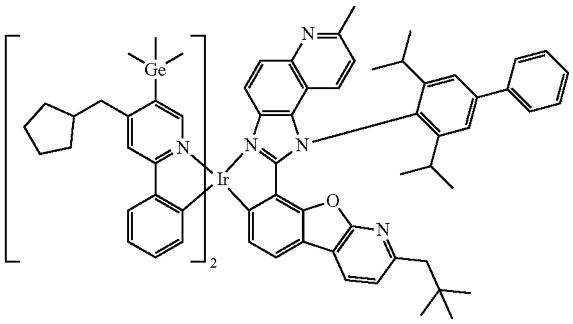
2506
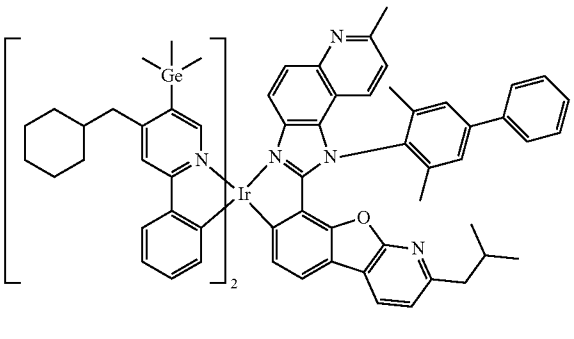
2507
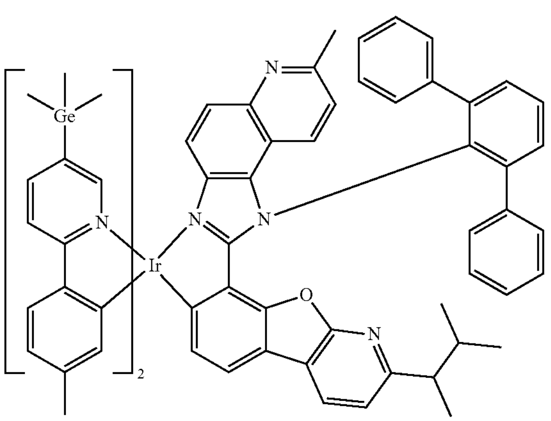
2508
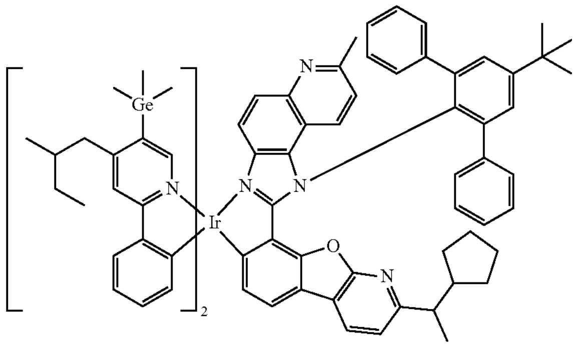
2509
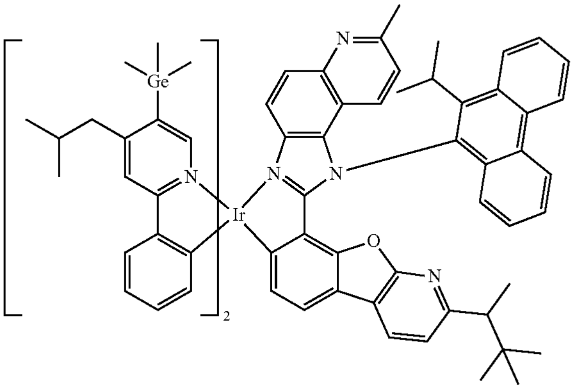
2510
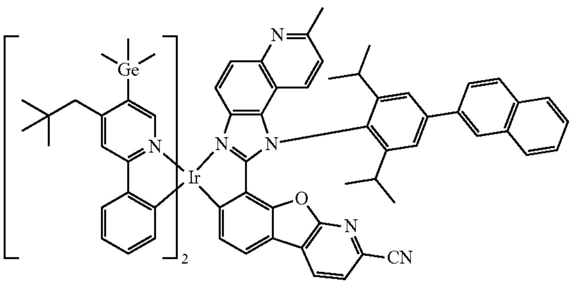

-continued
2511
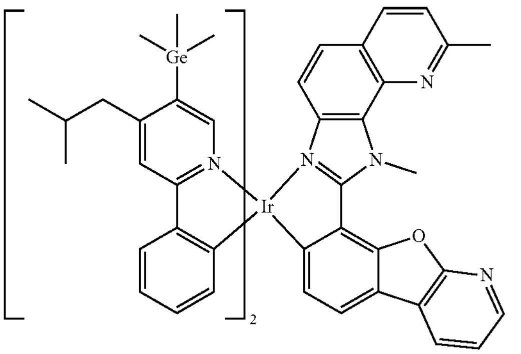
2512
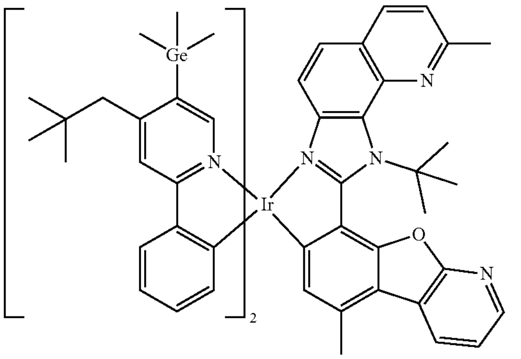
2513
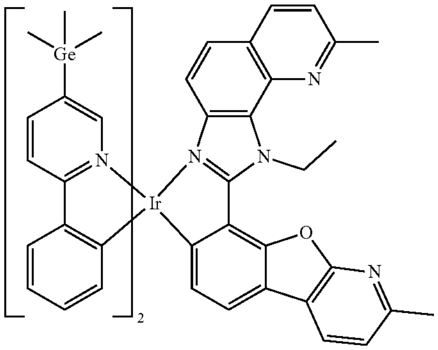
2514
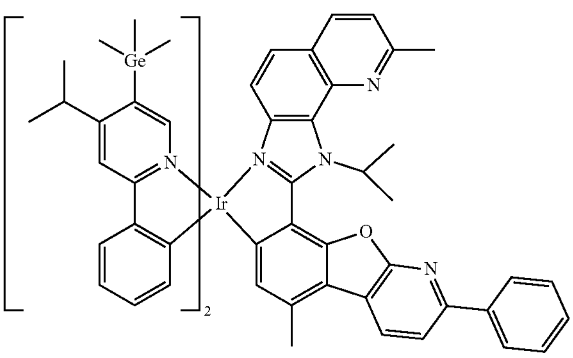
-continued
2515
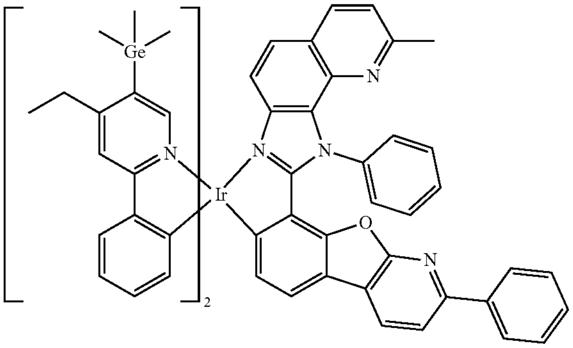
2516
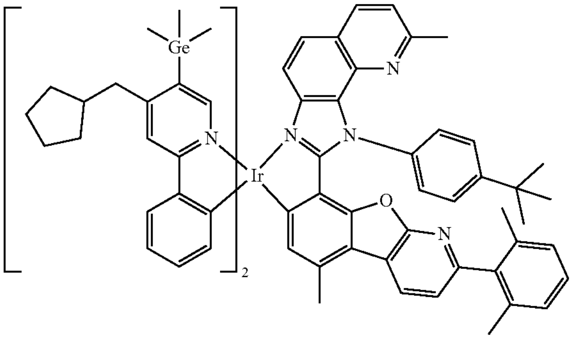
2517
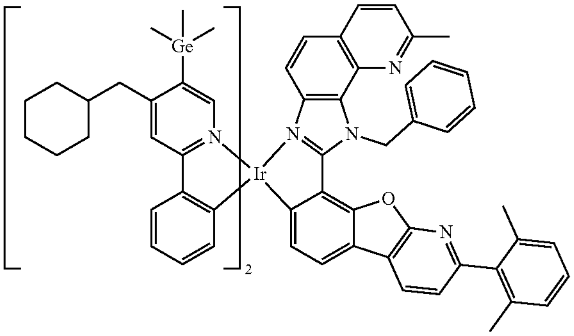
2518
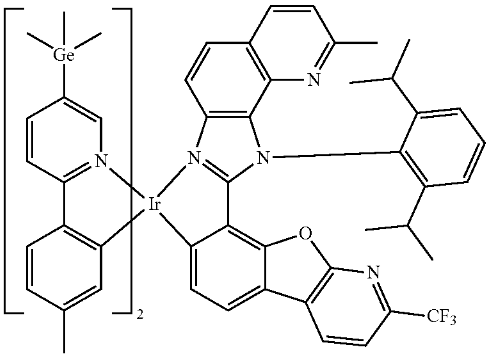

-continued
2519
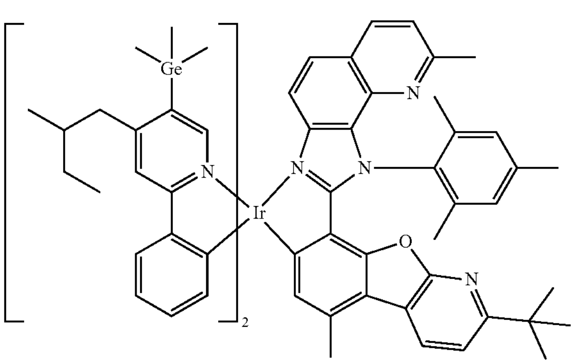
2520
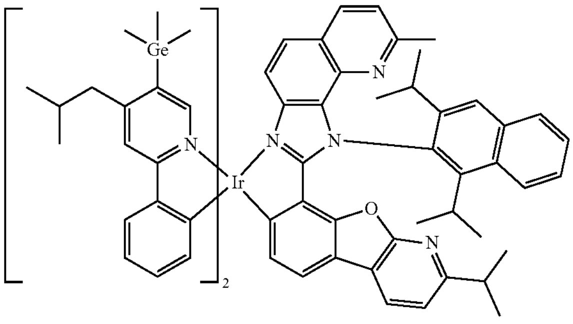
2521
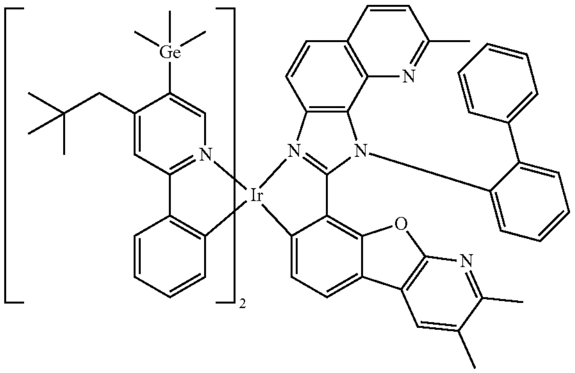
2522
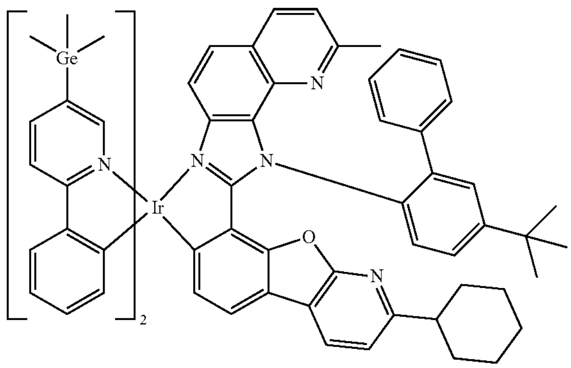
-continued
2523
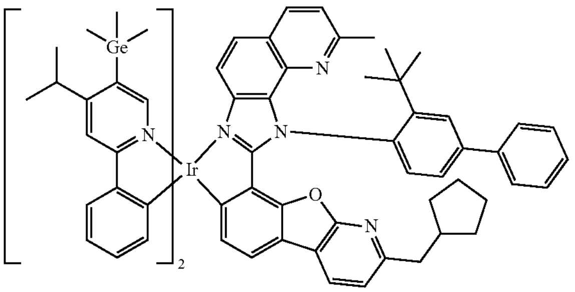
2524
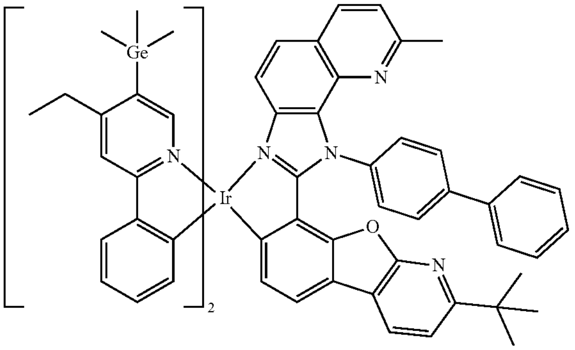
2525
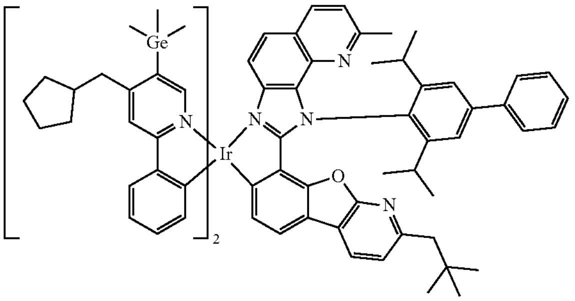
2526
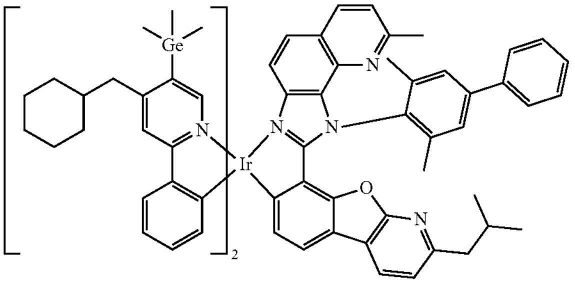

-continued
2527
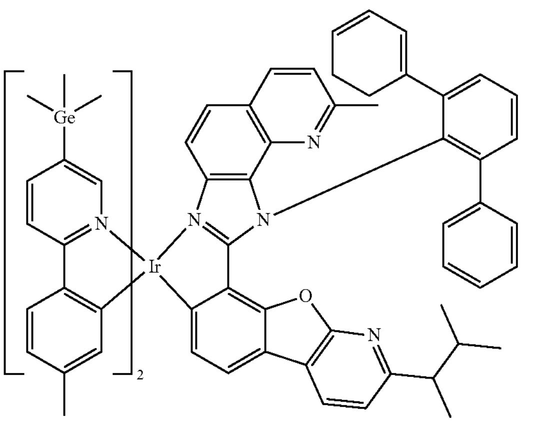
2528
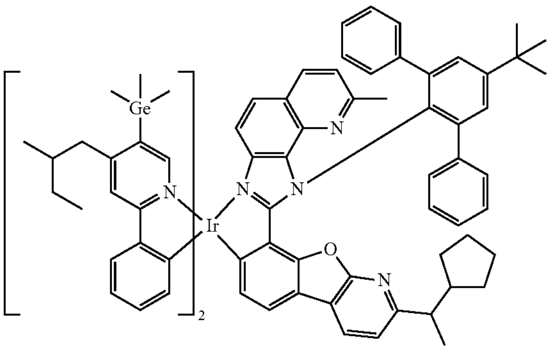
2529
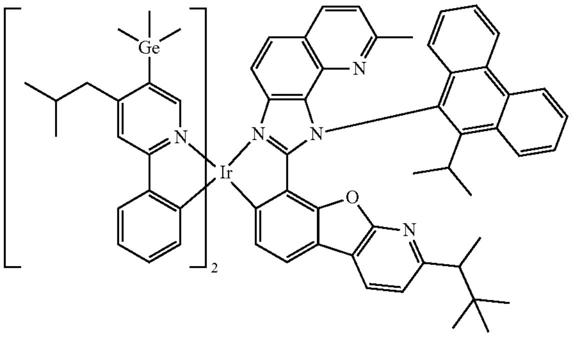
2530
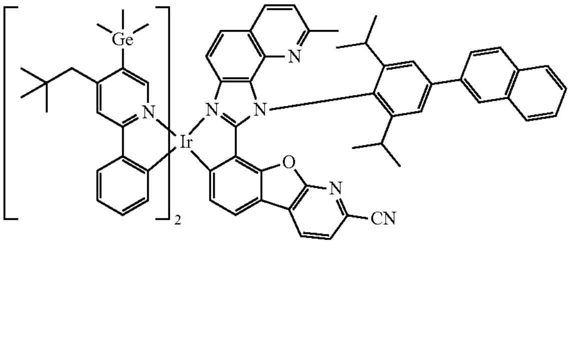
-continued
2531
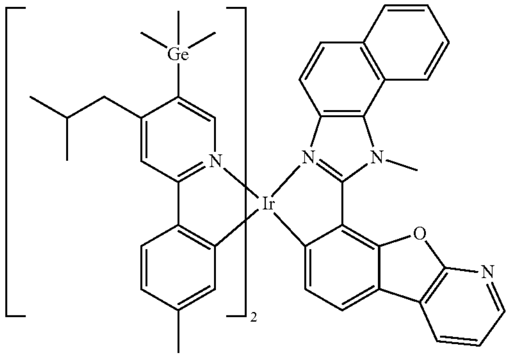
2532
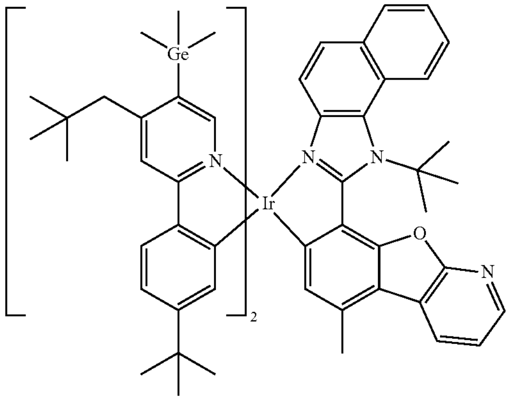
2533
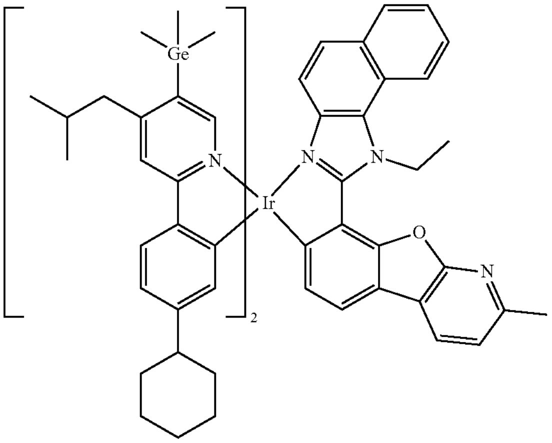
2534
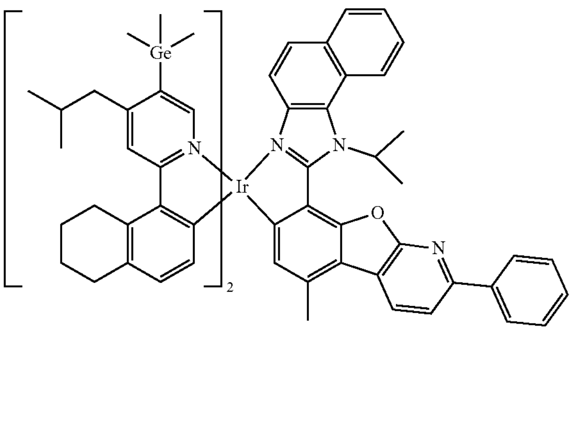

-continued
2535
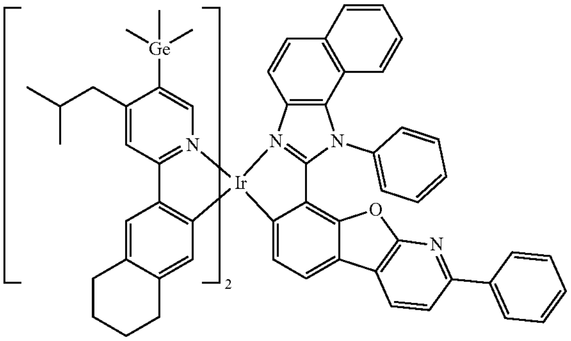
2536
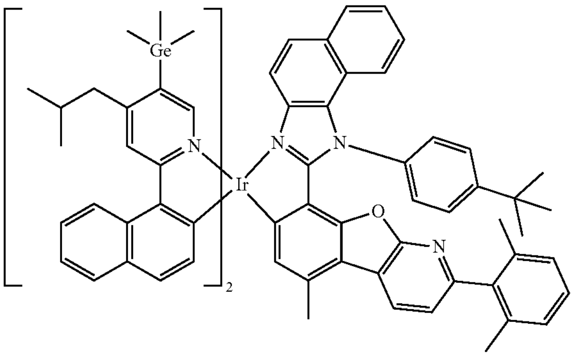
2537
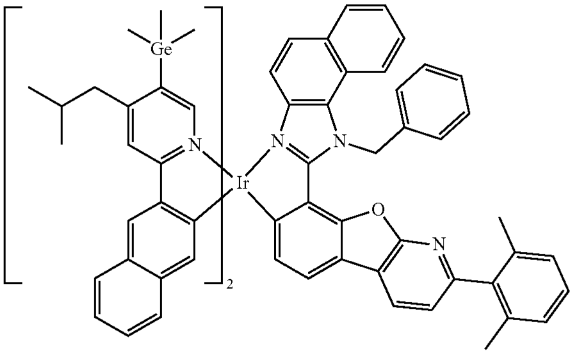
2538
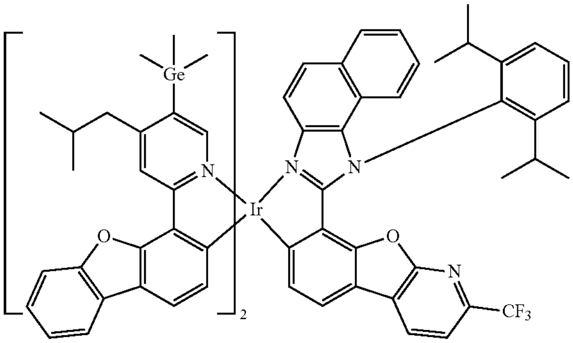
-continued
2539
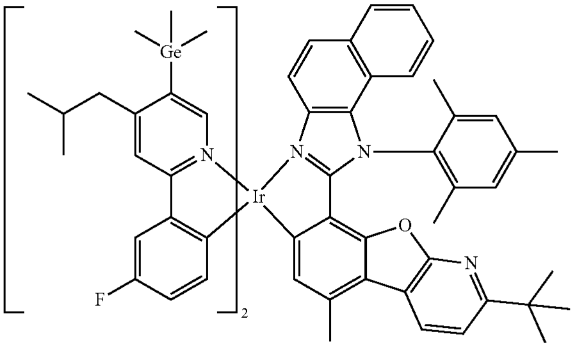
2540
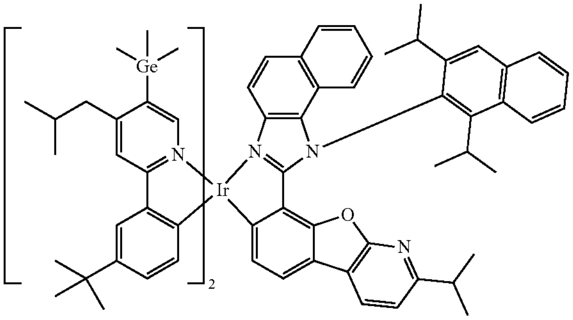
2541
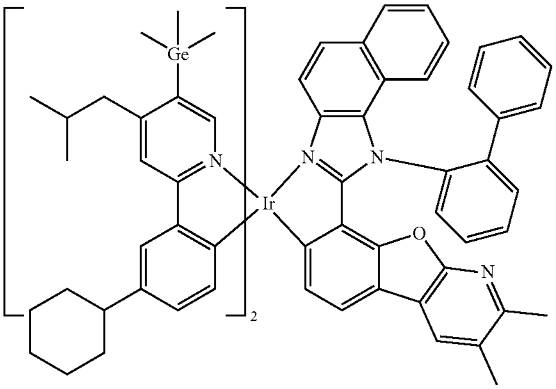
2542
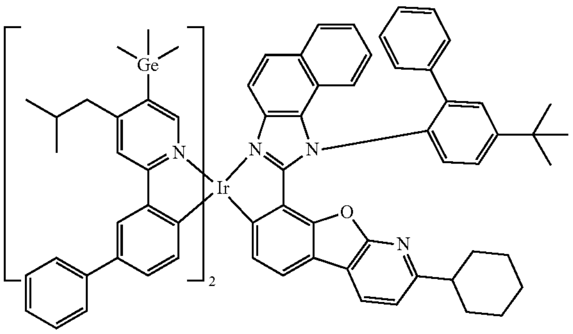

-continued
2543
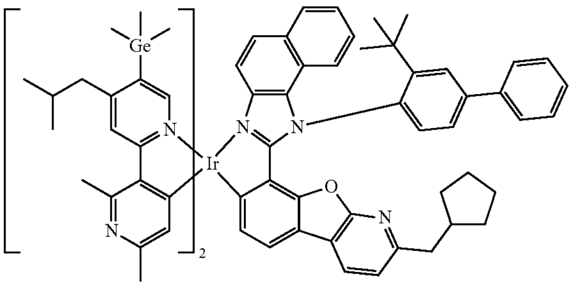
2544
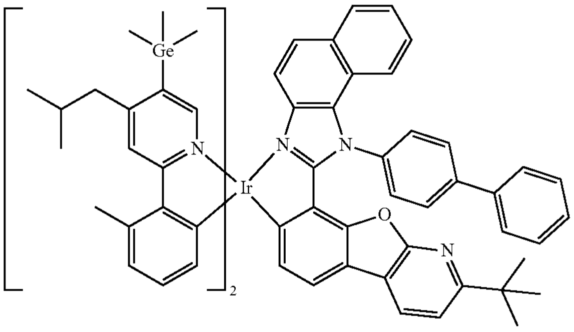
2545
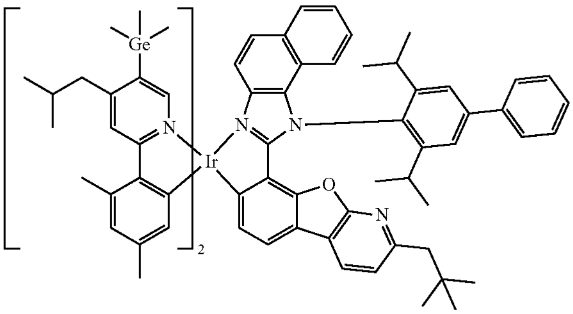
2546
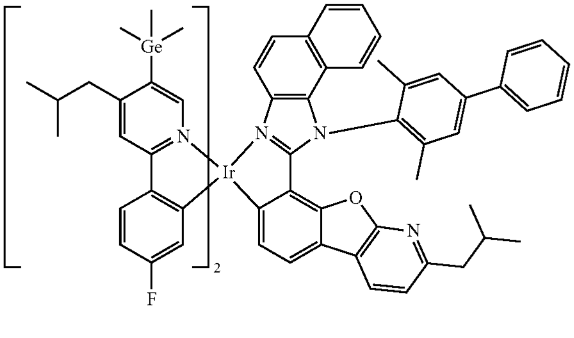
-continued
2547
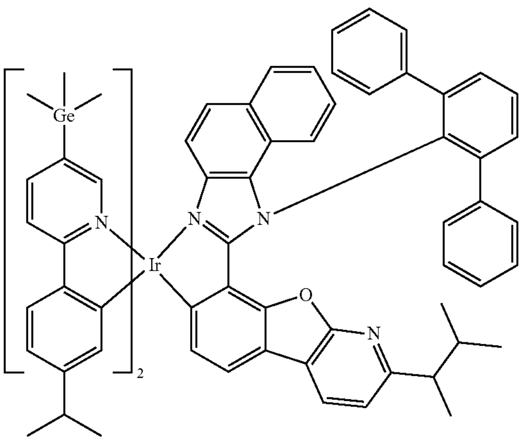
2548
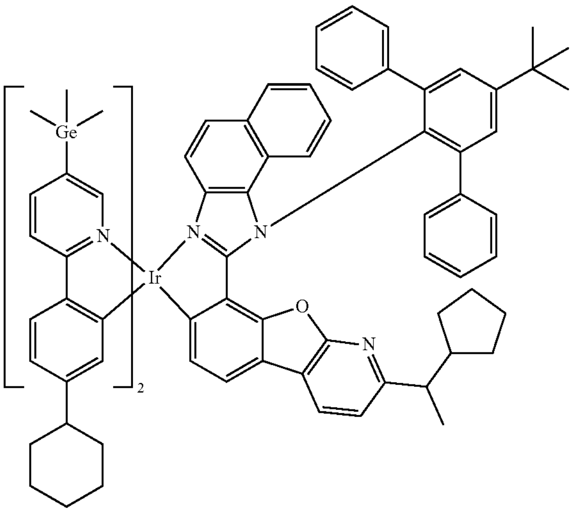
2549
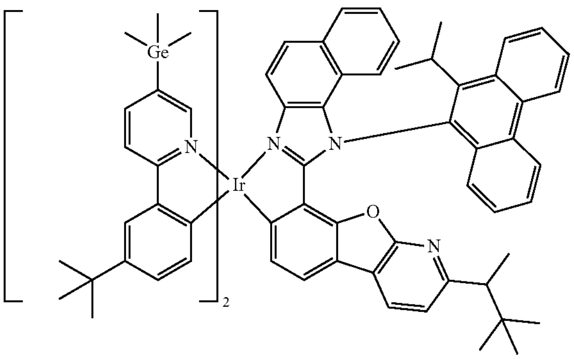

-continued
2550
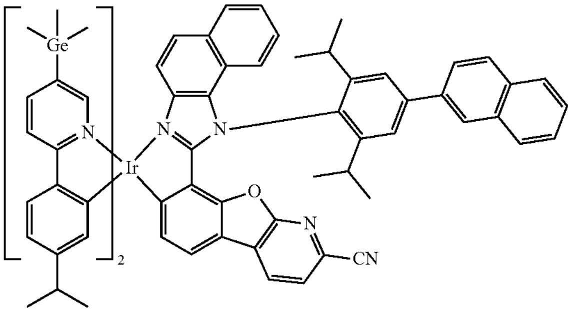
2551
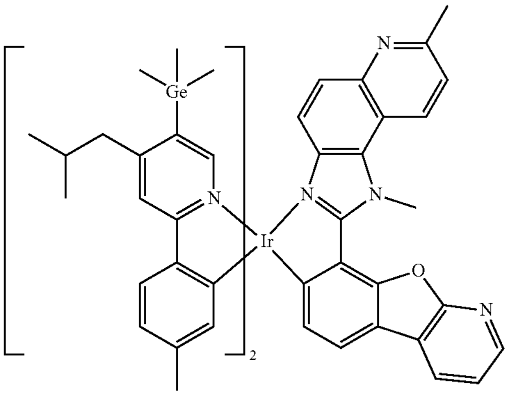
2552
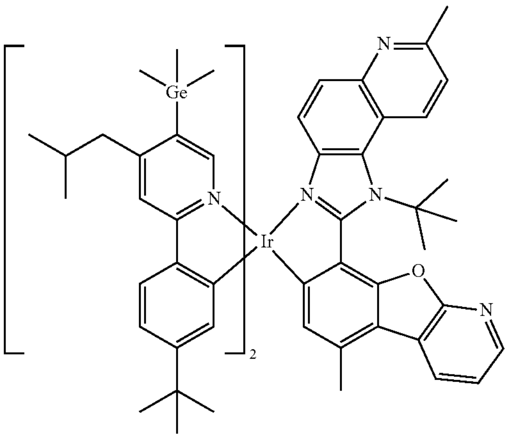
-continued
2553
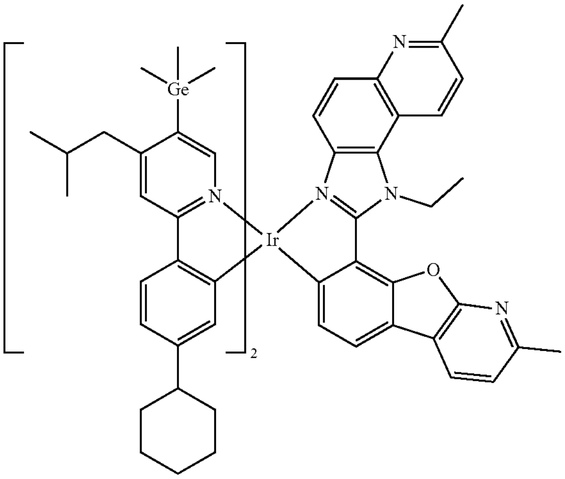
2554
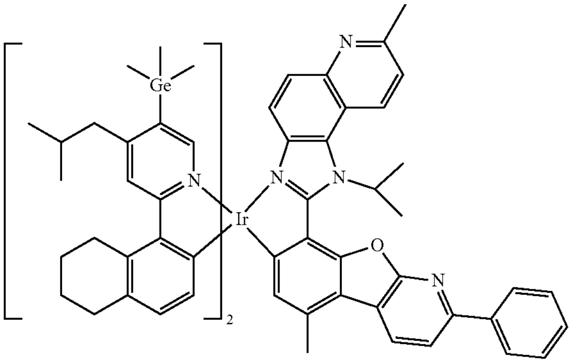
2555
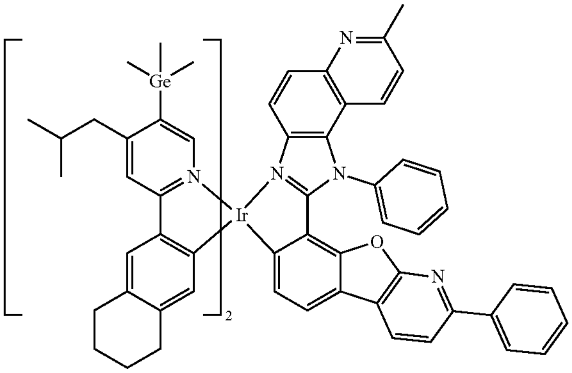

2556
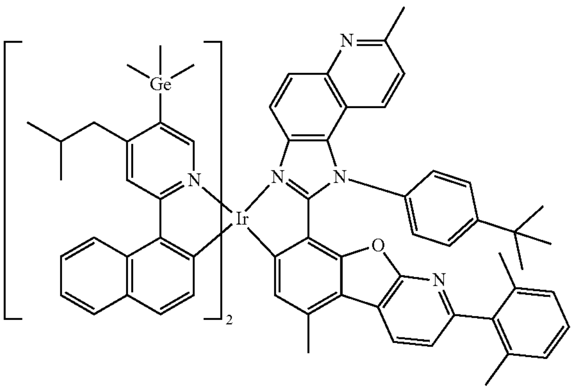
2557
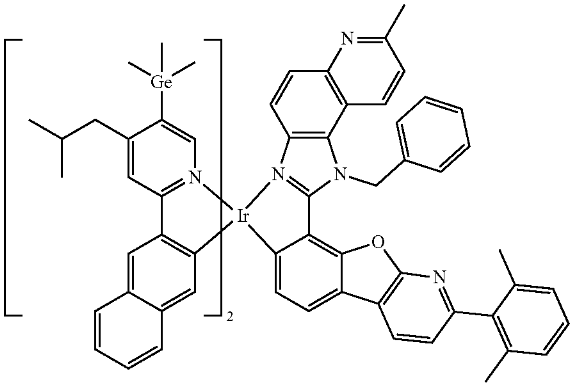
2558
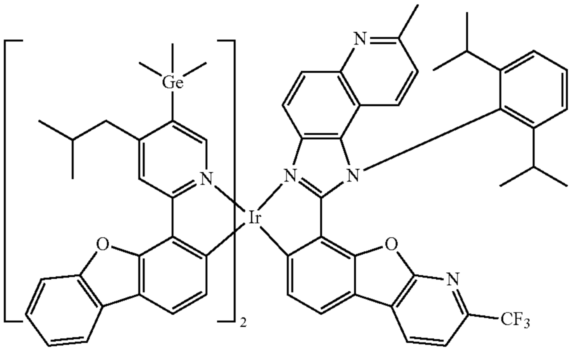
2559
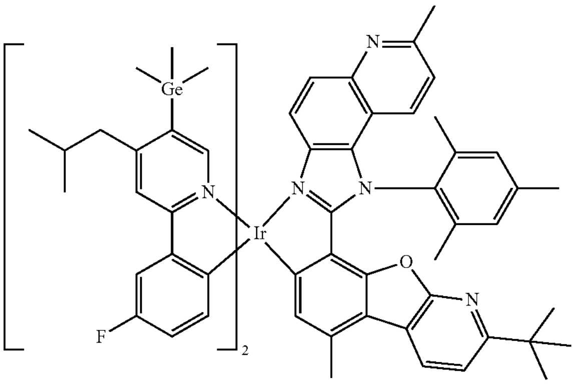
2560
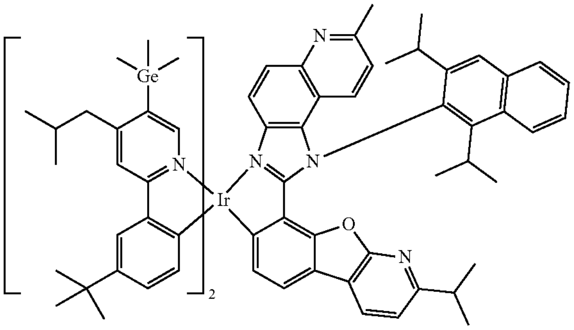
2561
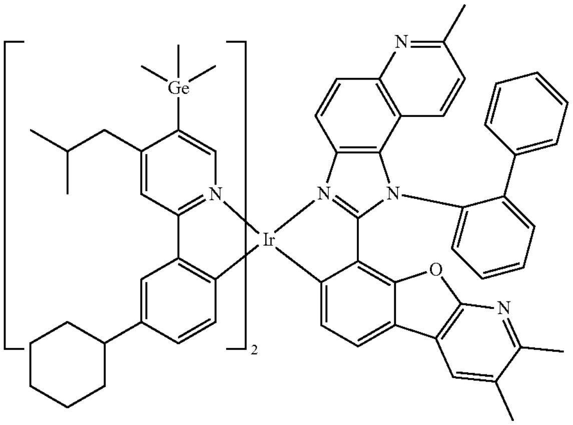
2562
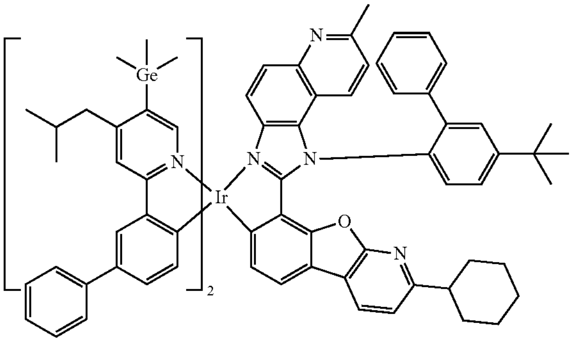
2563
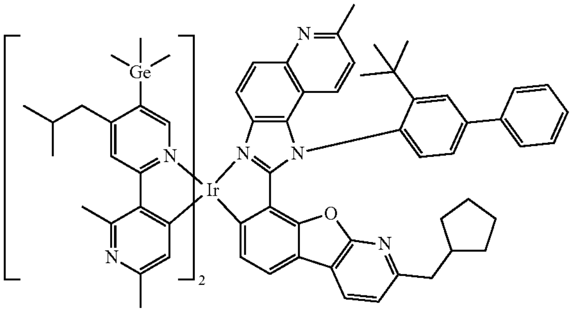

-continued
2564
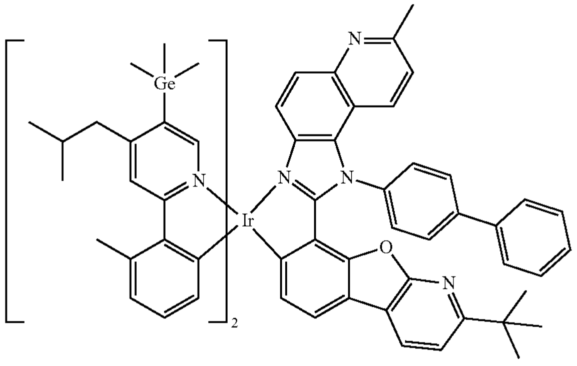
2565
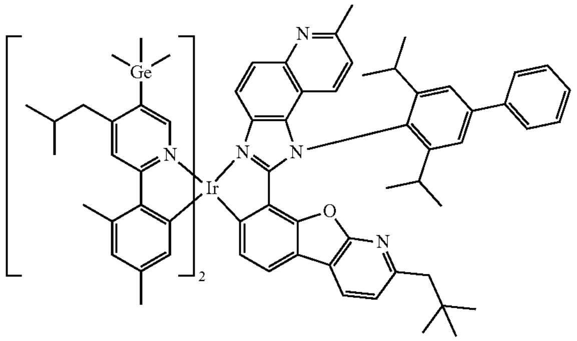
2566
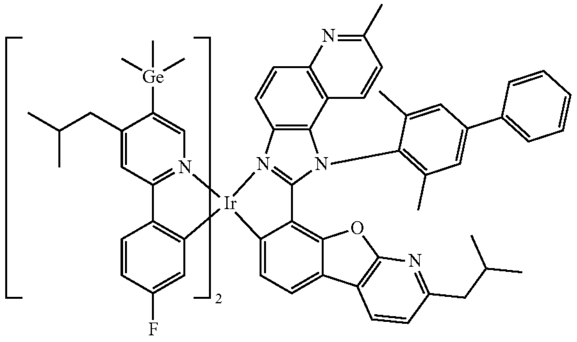
2567
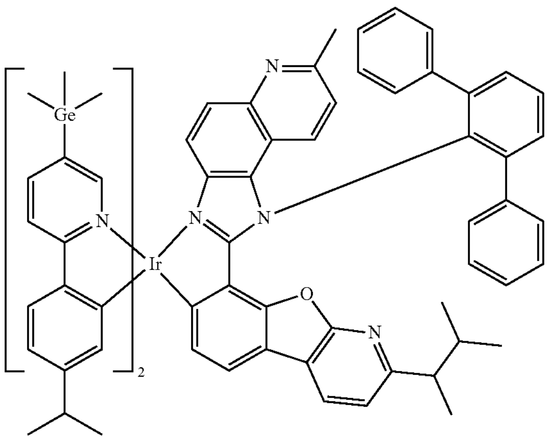
-continued
2568
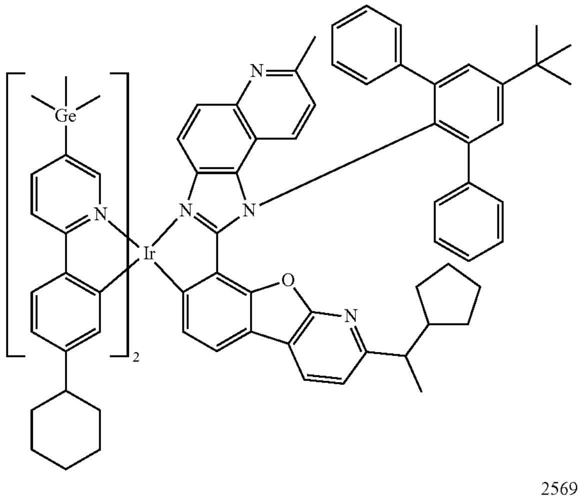
2569
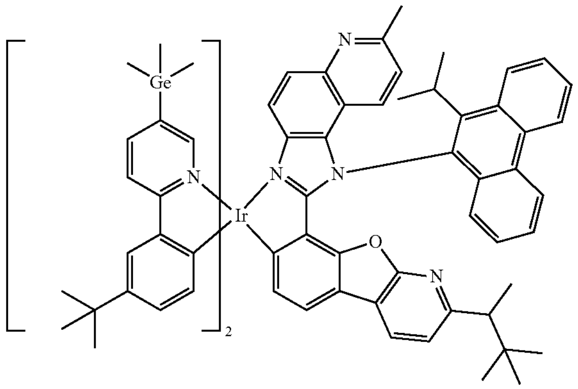
2570
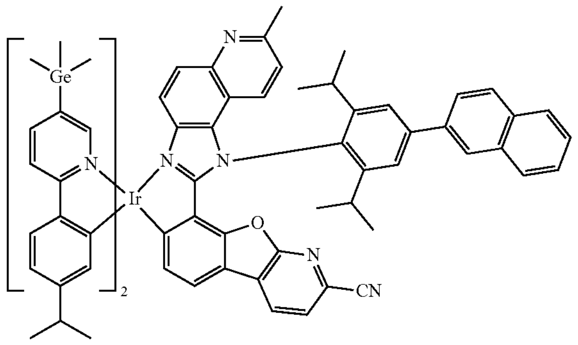
2571
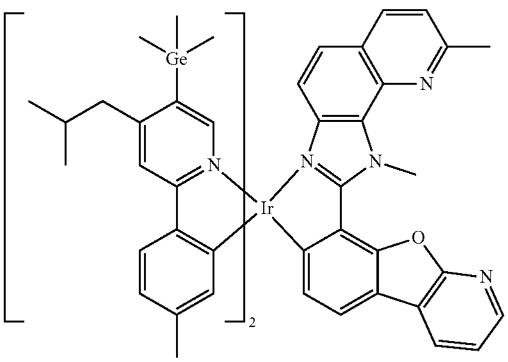

2572
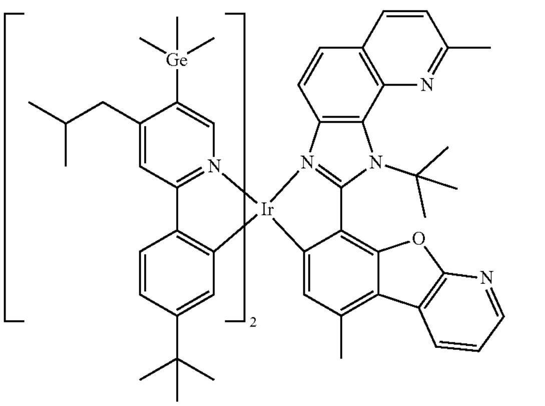
2573
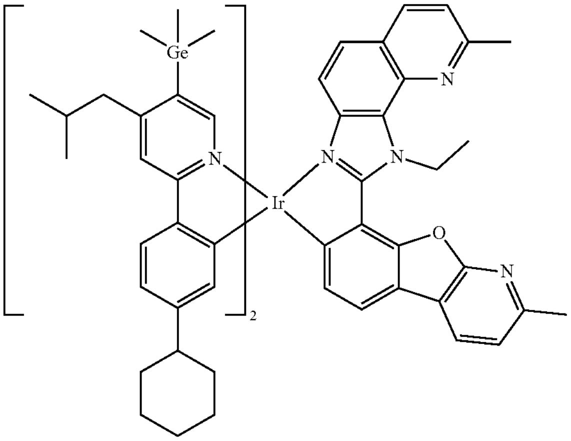
2574
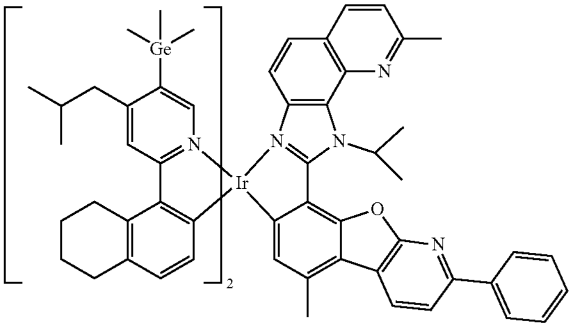
2575
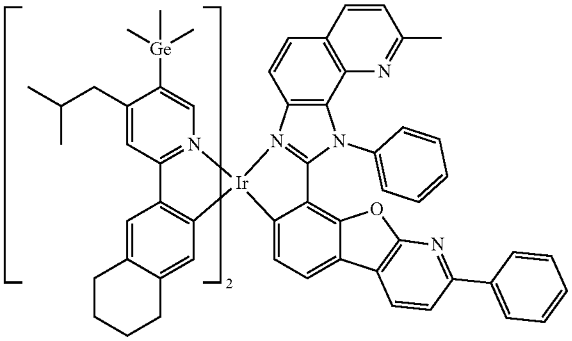
2576
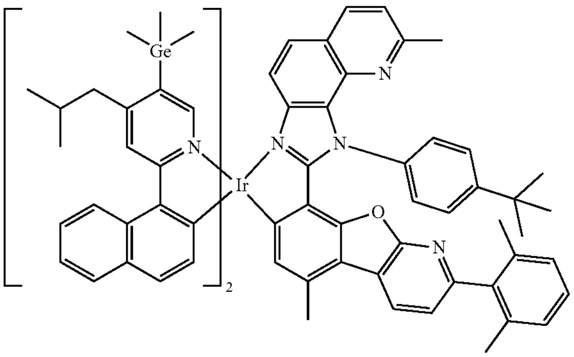
2577
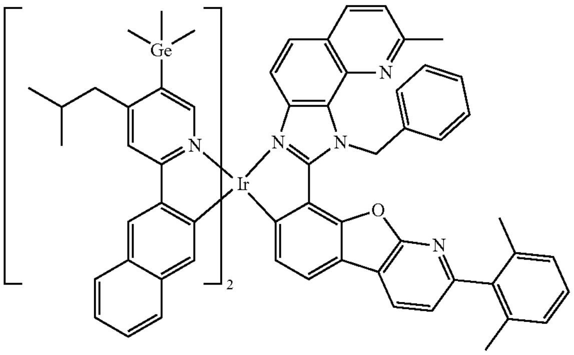
2578
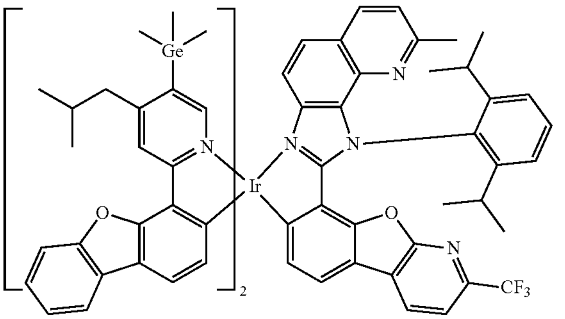
2579
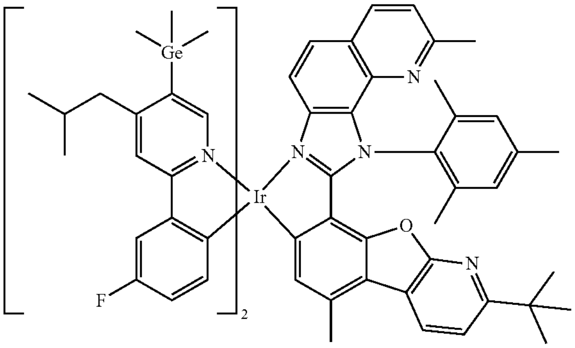

-continued
2580
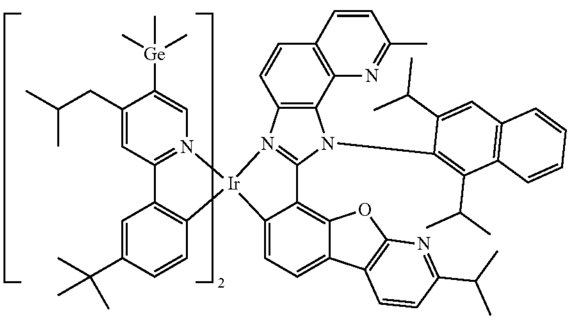
2581
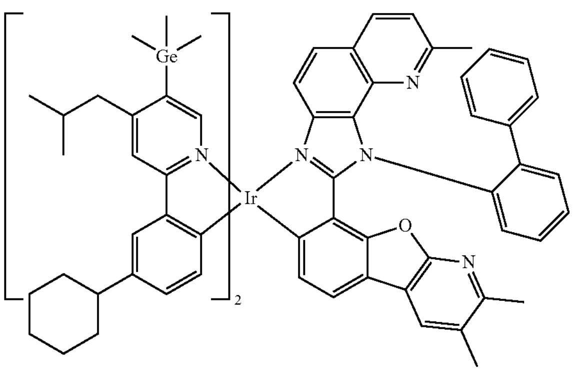
2582
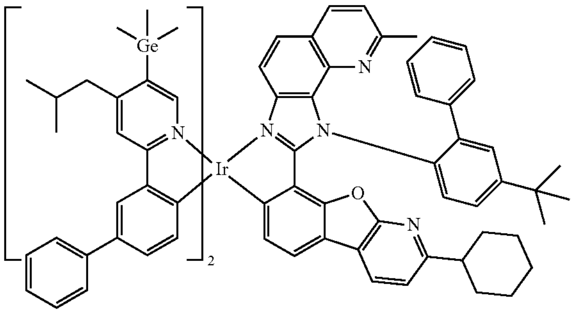
2583
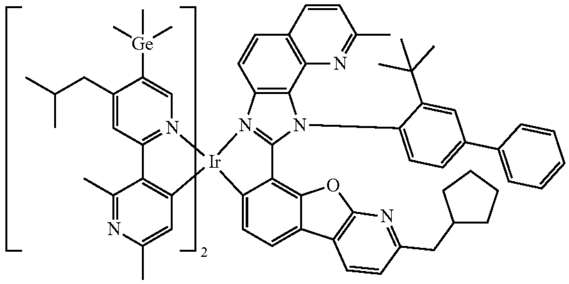
-continued
2584
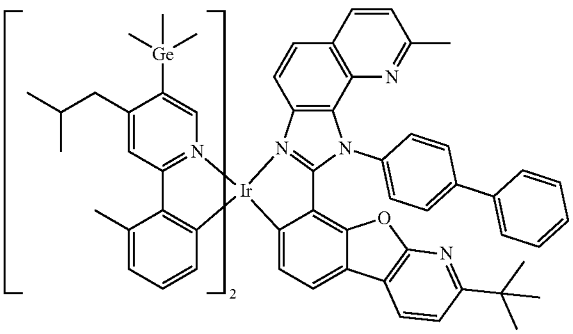
2585
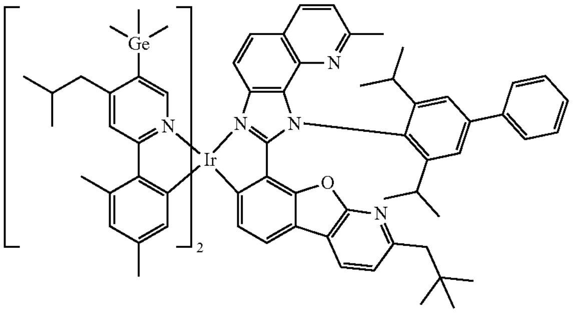
2586
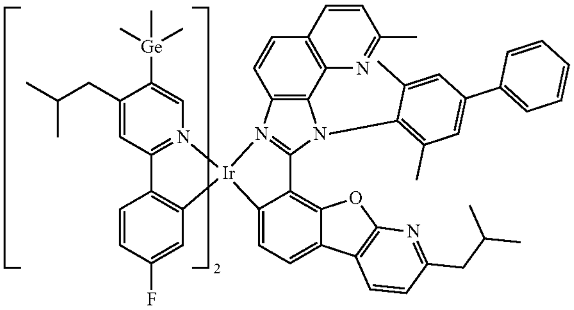
2587
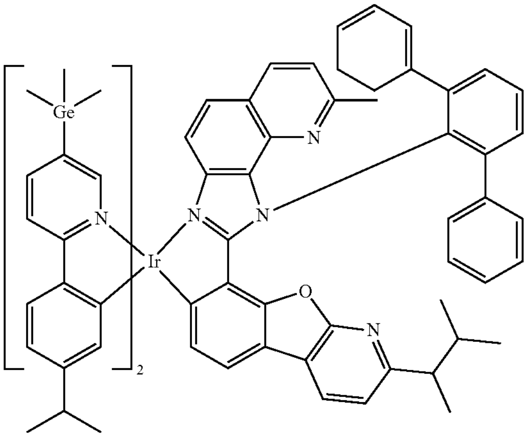

-continued
2588
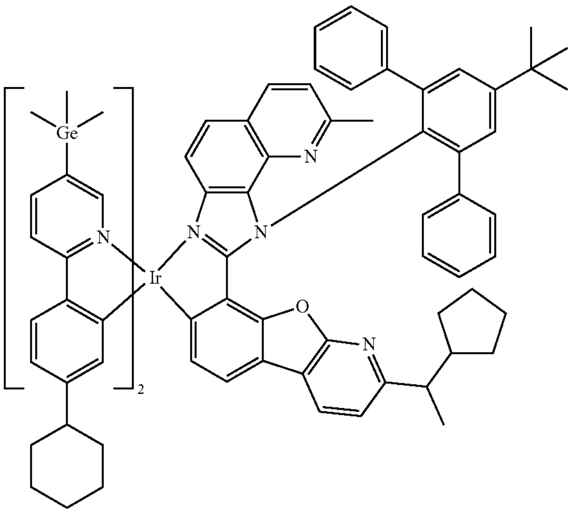
2589
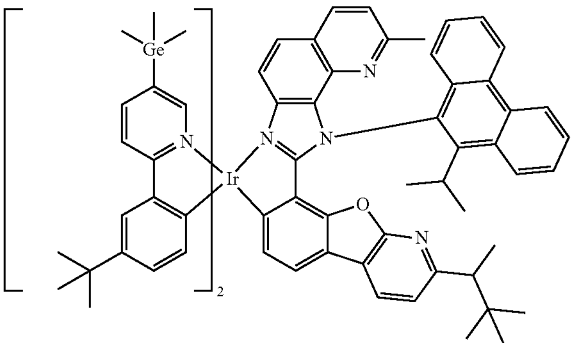
2590
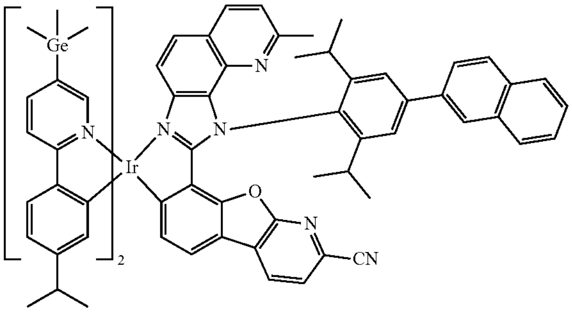
2591
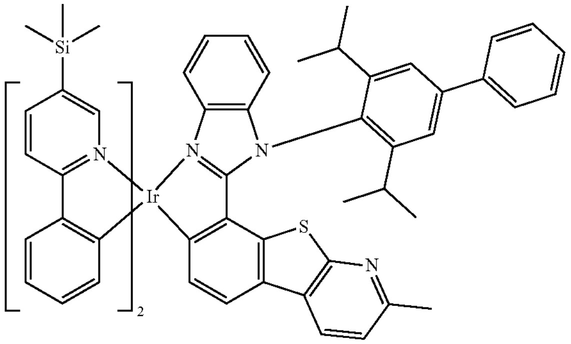
-continued
2592
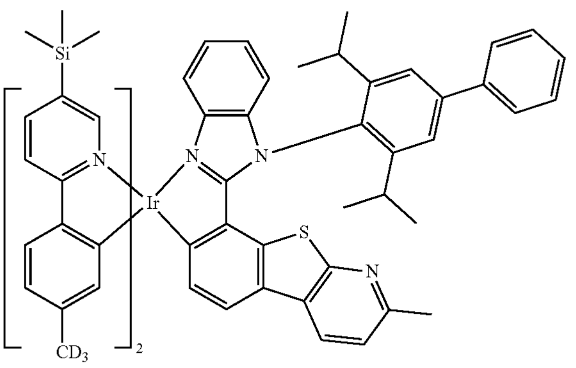
2593
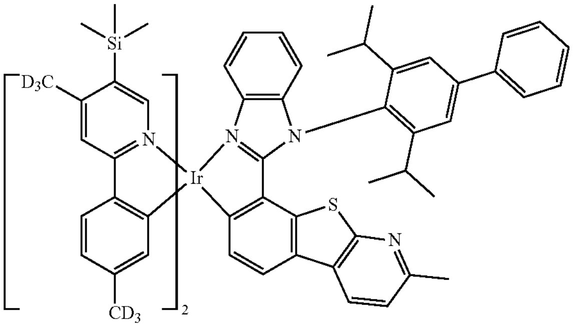
2594
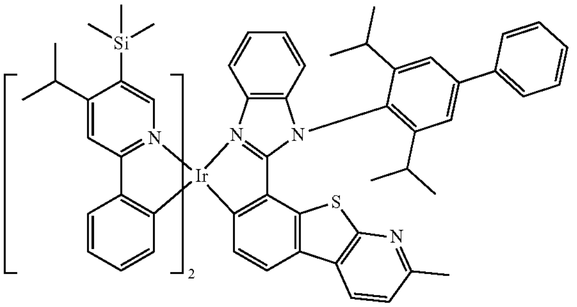
2595
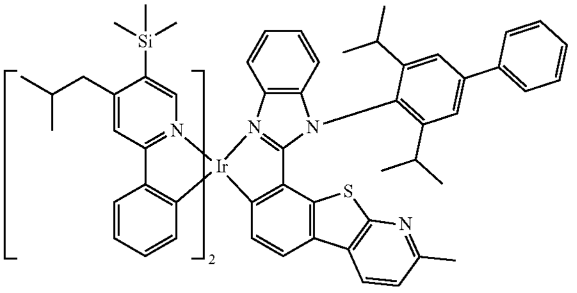

-continued
2596
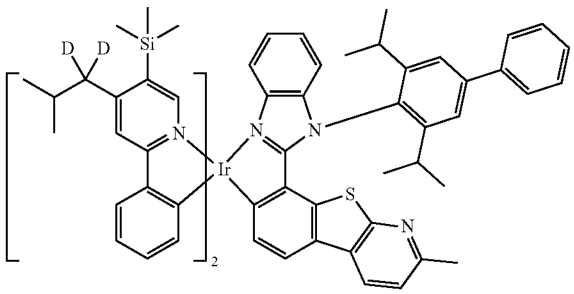
2597
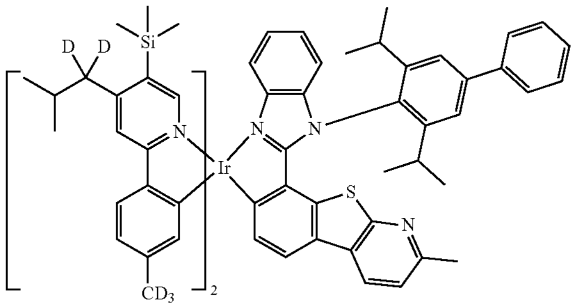
2598
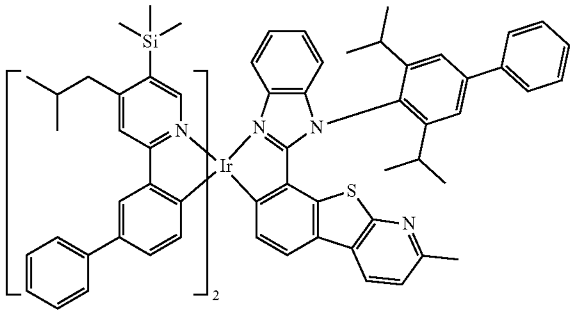
2599
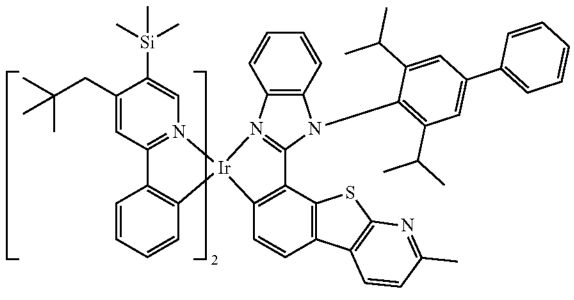
2600
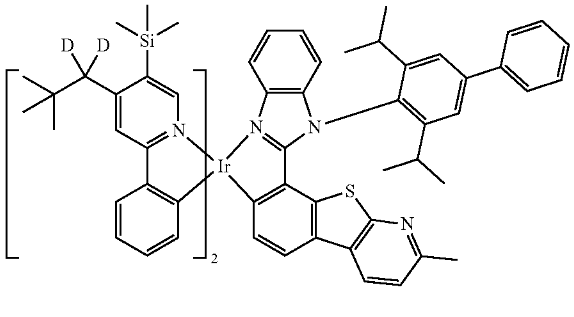
-continued
2601
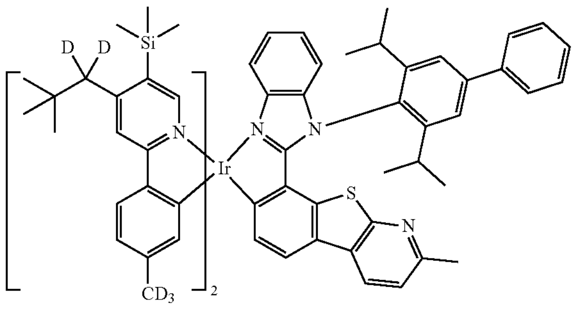
2602
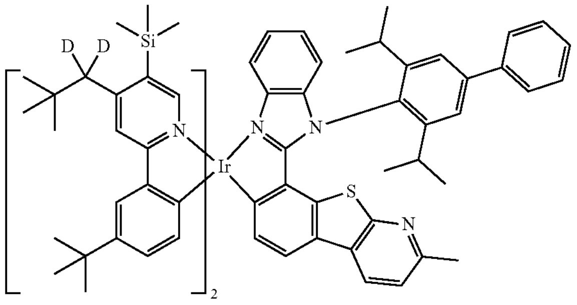
2603
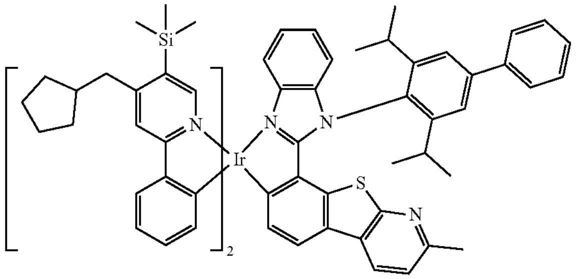
2604
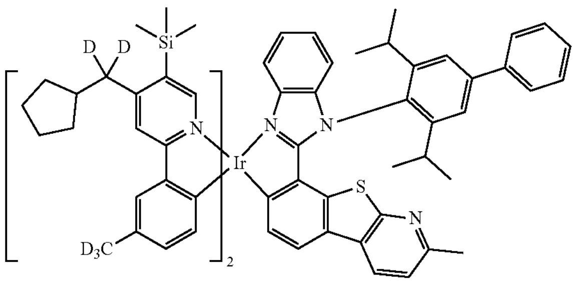
2605
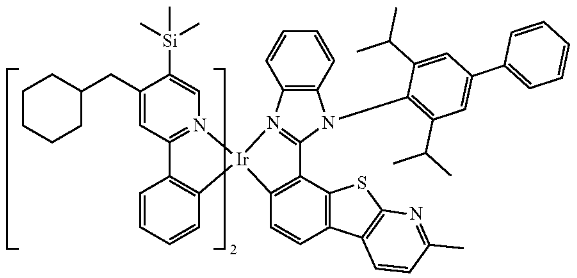

-continued
2606
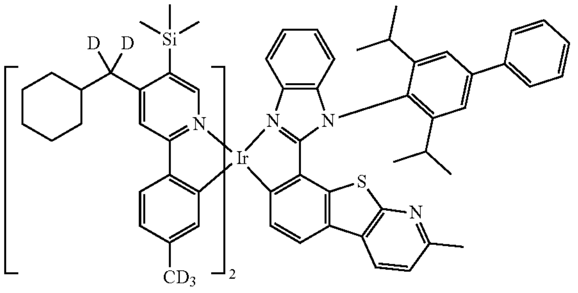
2607
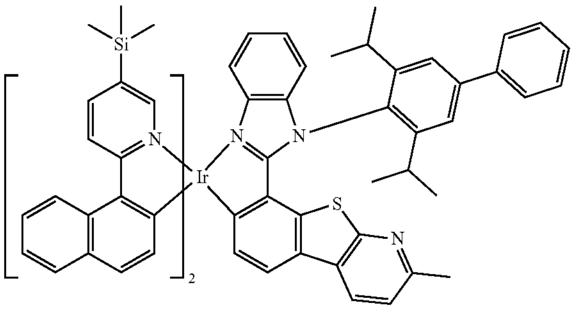
2608
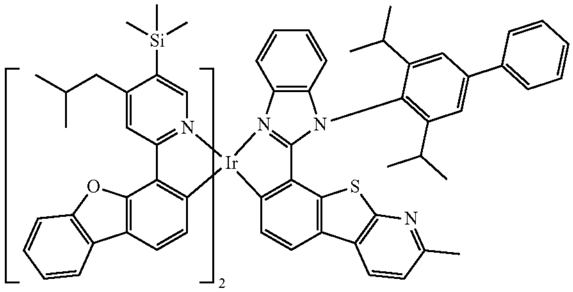
-continued
2609
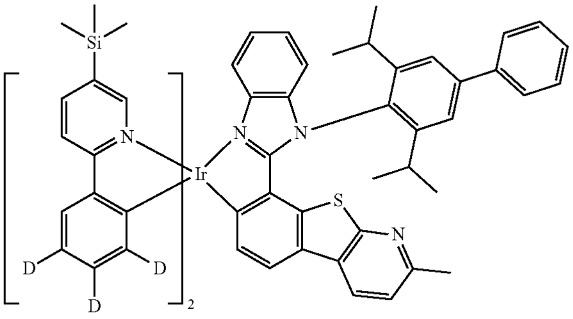
2610
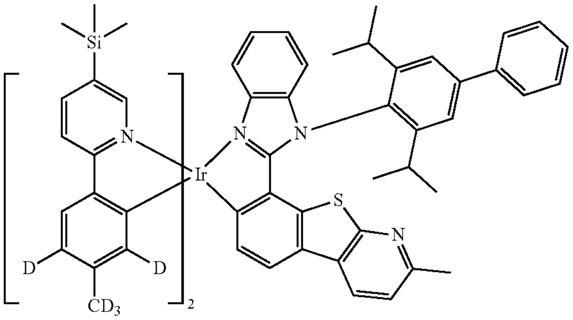
2611
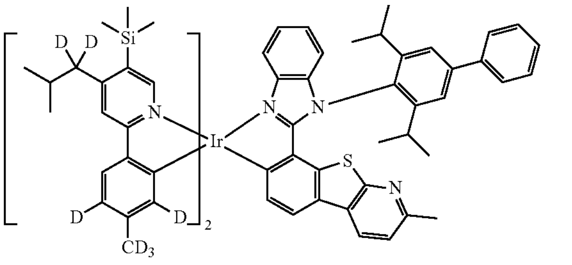
2612
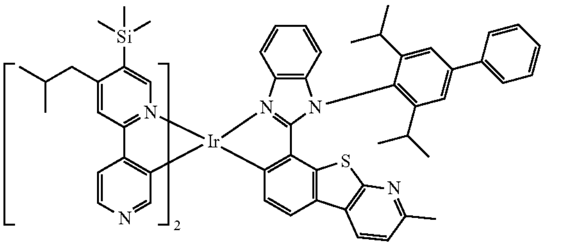
2613
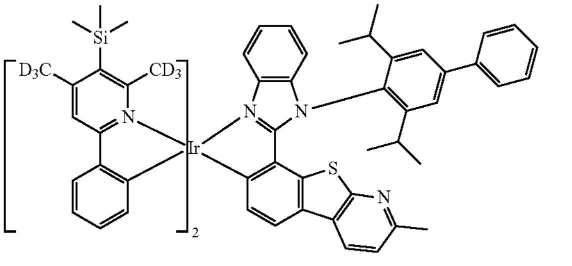
2614
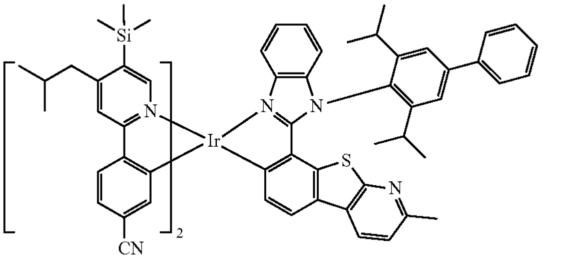

-continued
2615
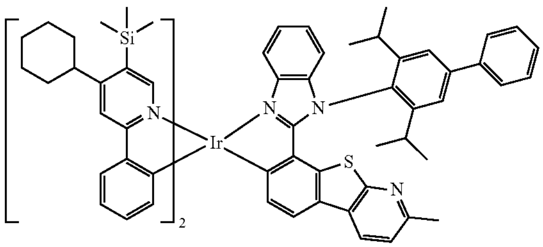
2616
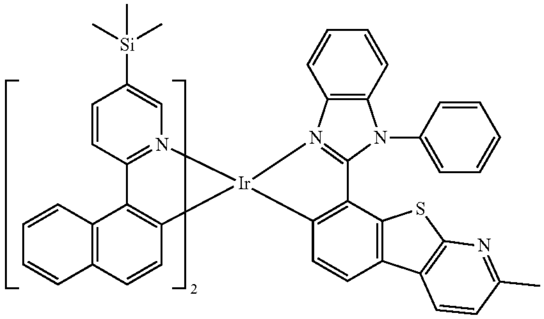
2617
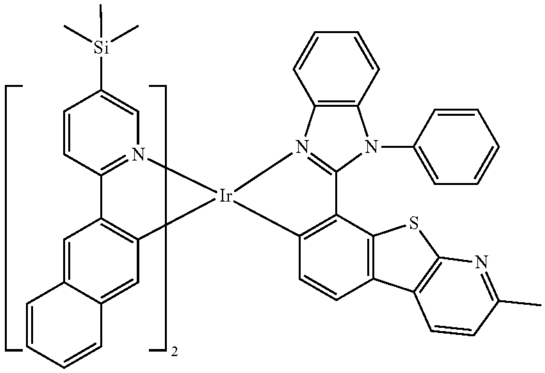
2618
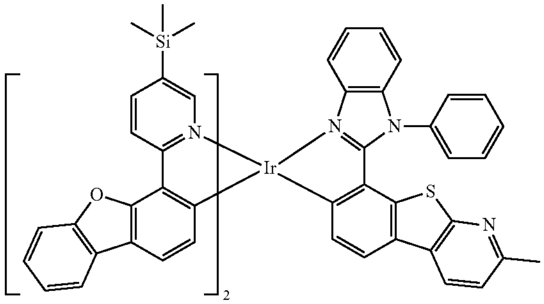
2619
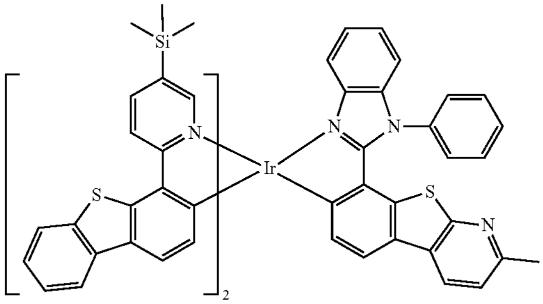
2620
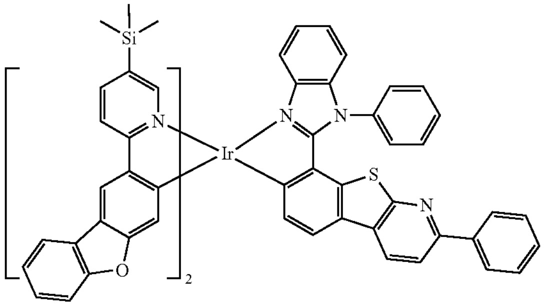
2621
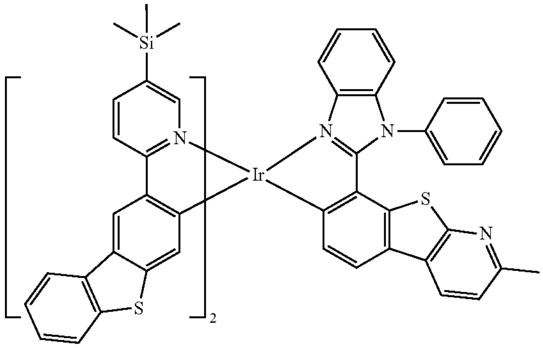

-continued
2622
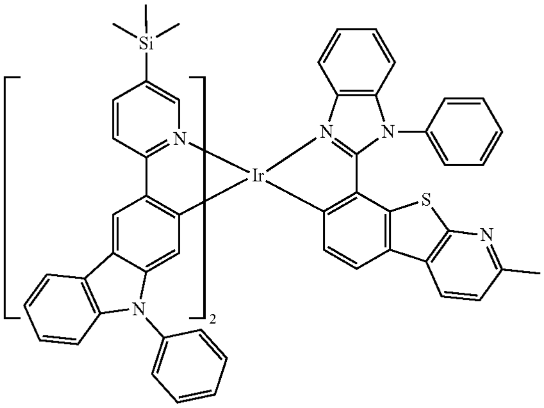
2623
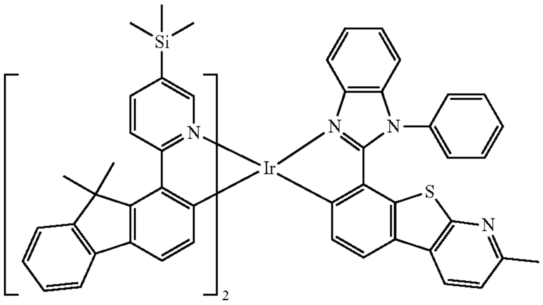
2624
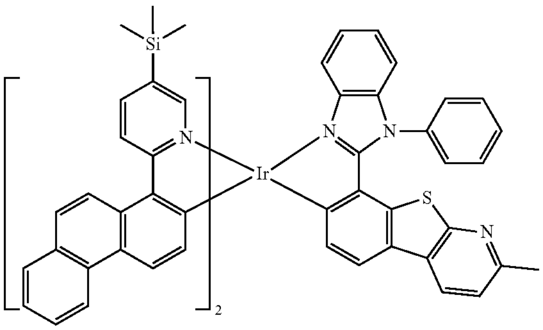
2625
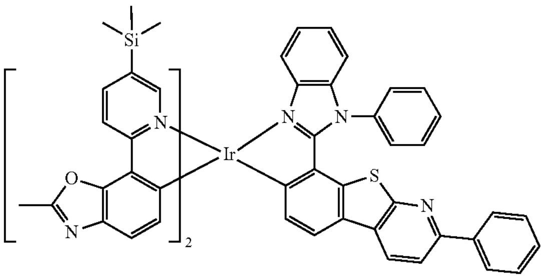
2626
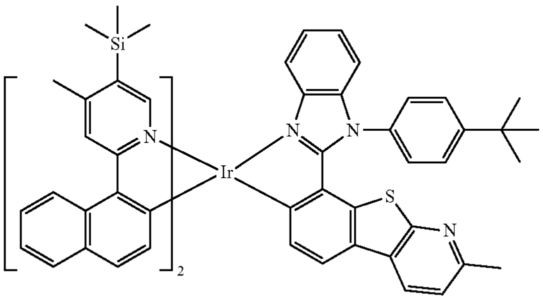
2627
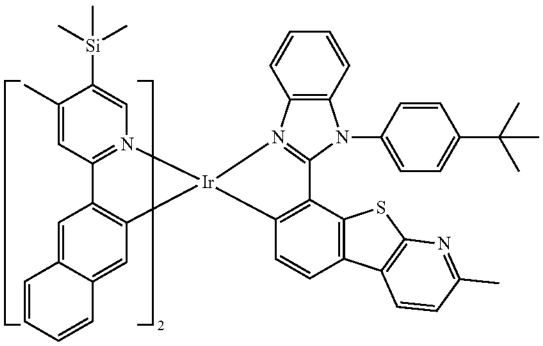
2628
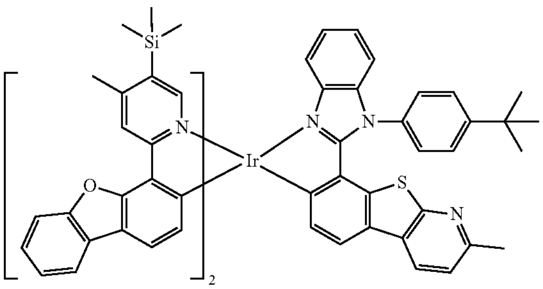
2629
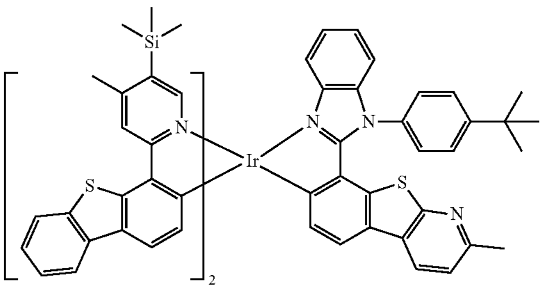

-continued
2630
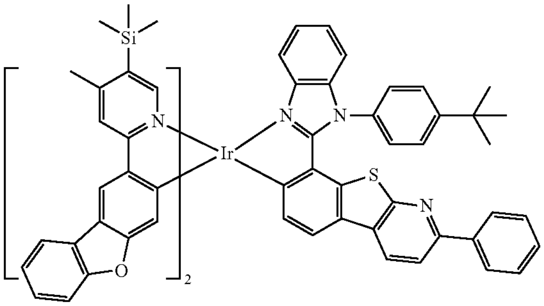
2631
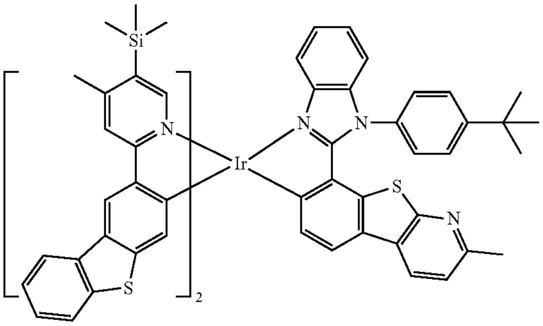
2632
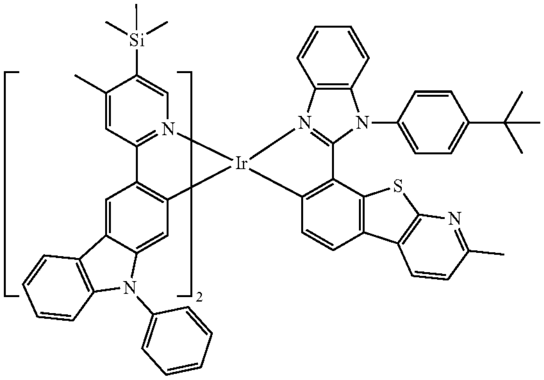
2633
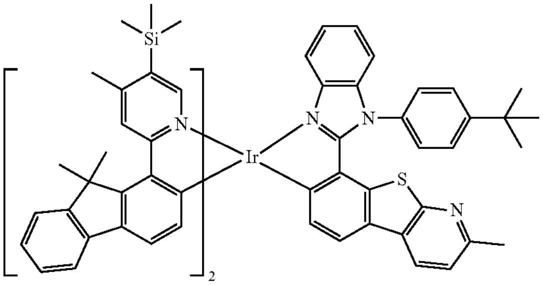
2634
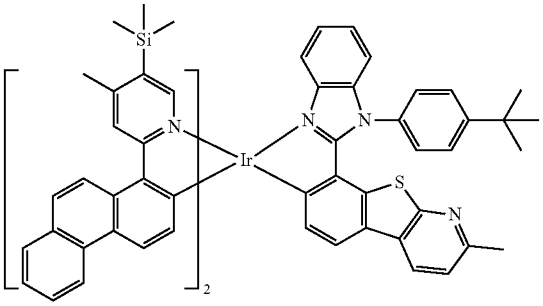
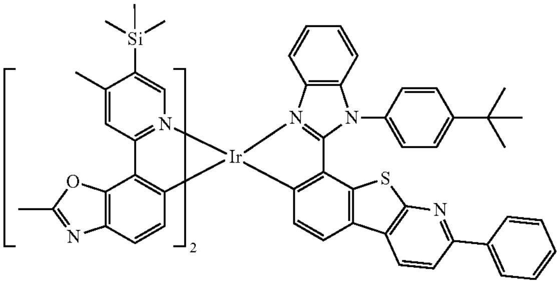
2636
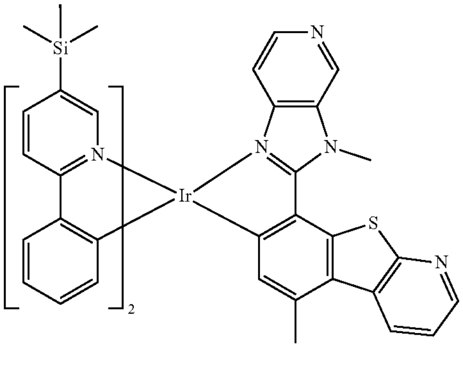
2637
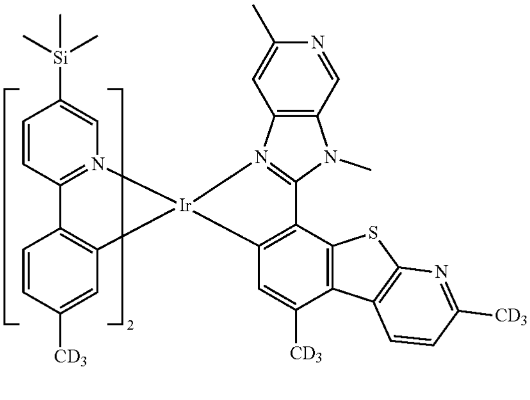

-continued
2638
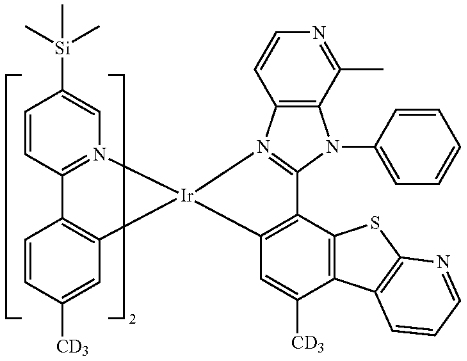
2639
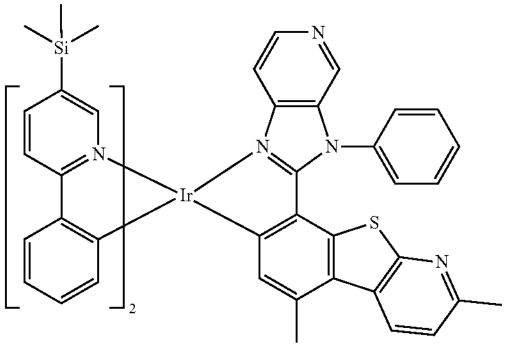
2640
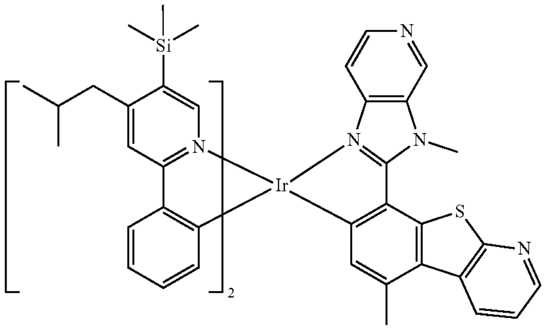
2641
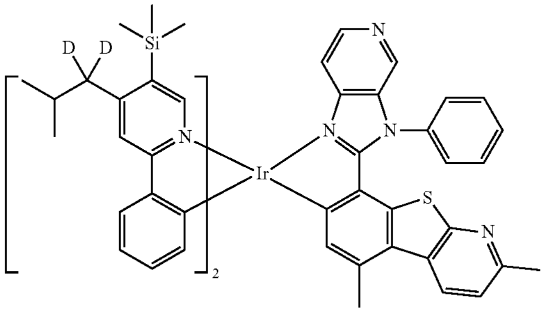
2642
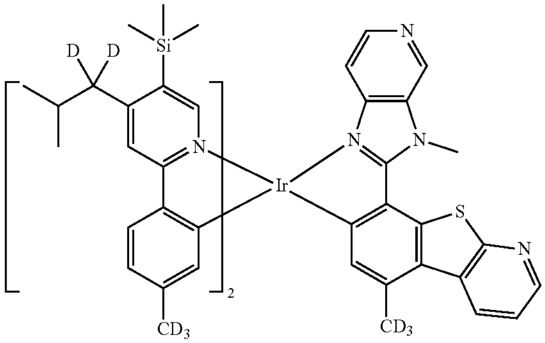
2643
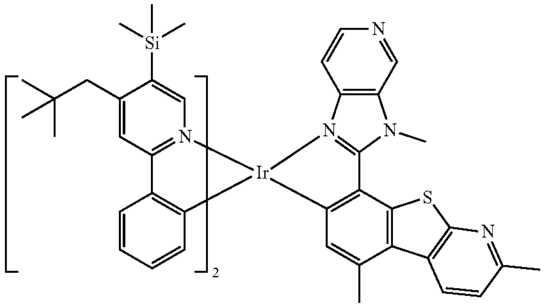
2644
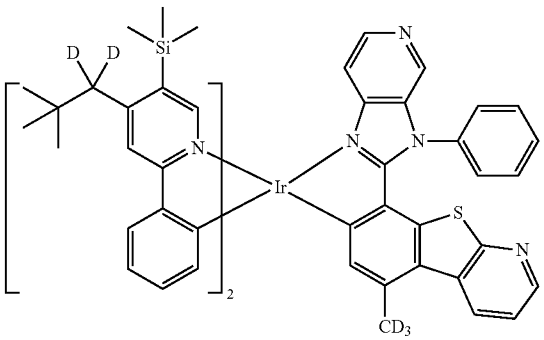
2645
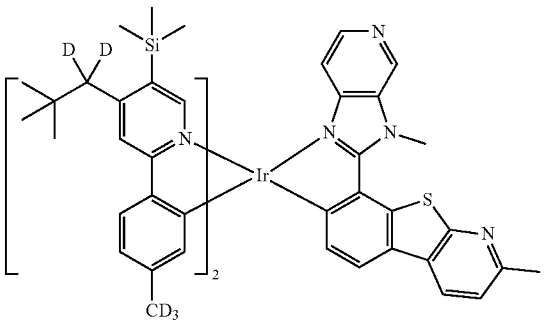

-continued
2646
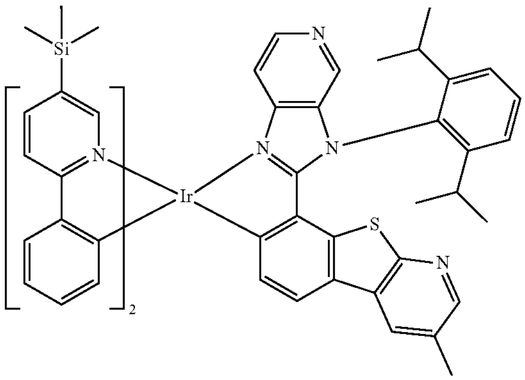
2647
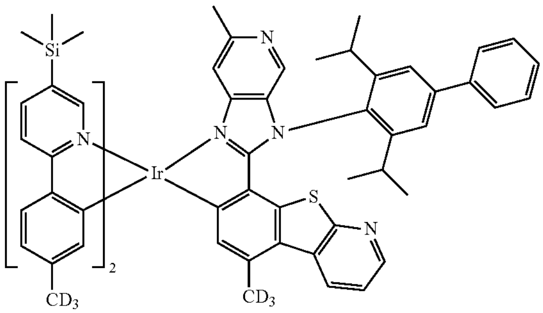
2648
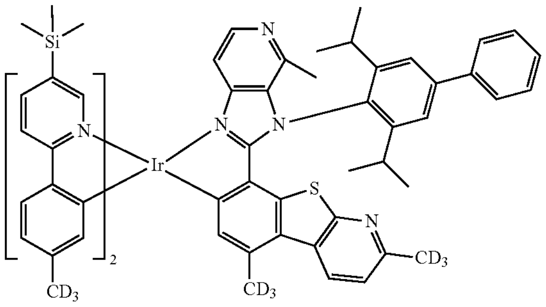
2649
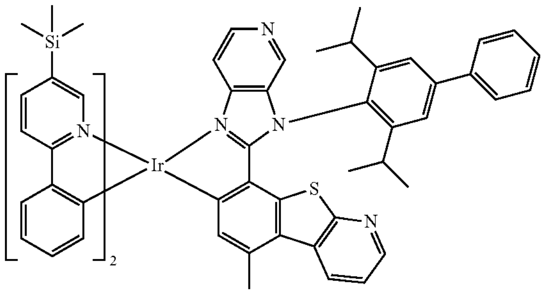
2650
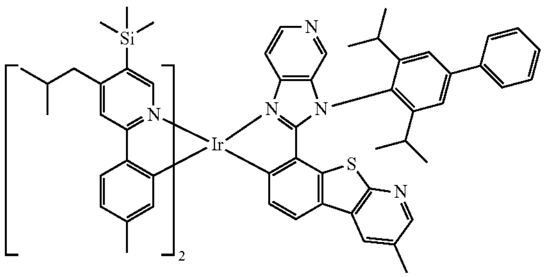
2651
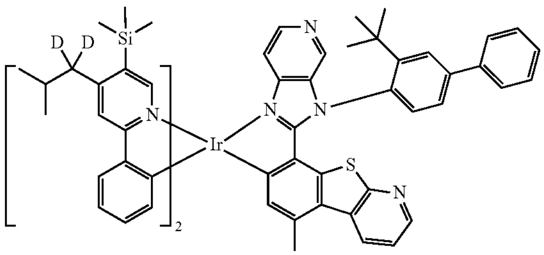
2652
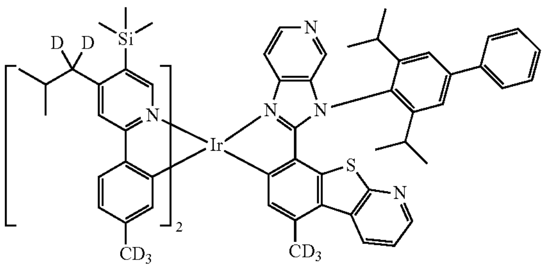
2653
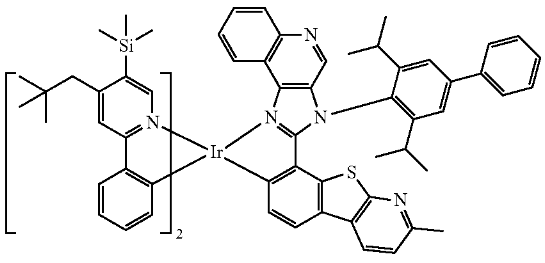
2651
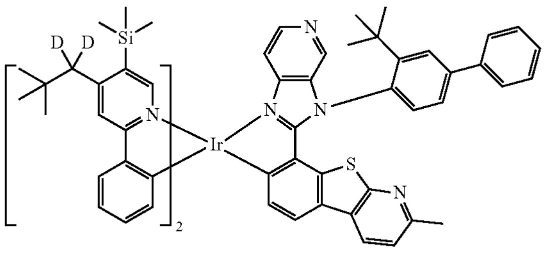
2655
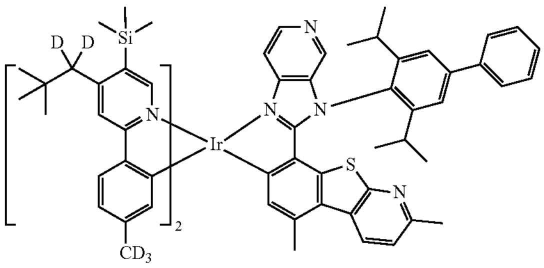

-continued
2656
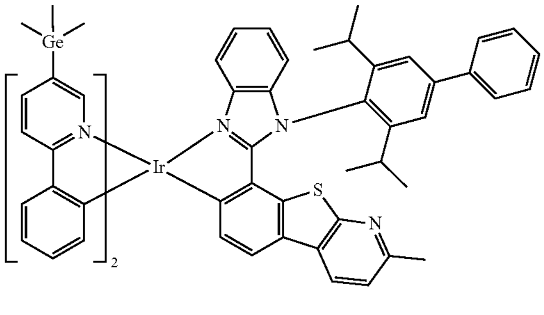
2657
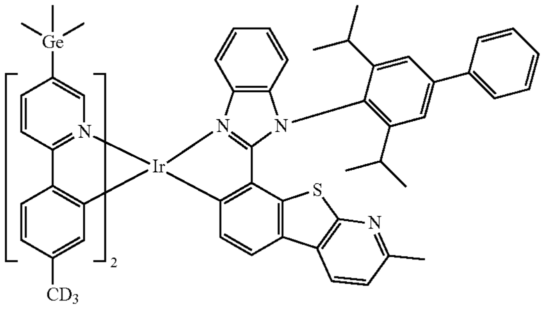
2658
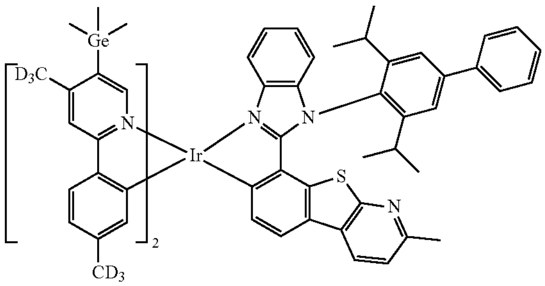
2659
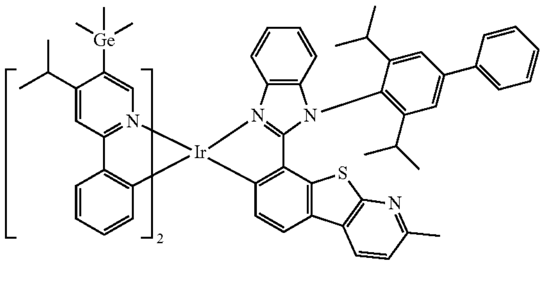
2660
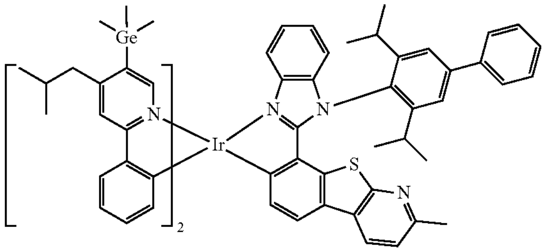
2661
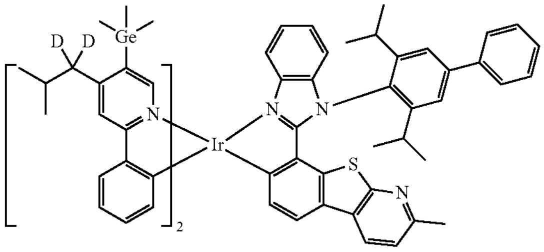
2662
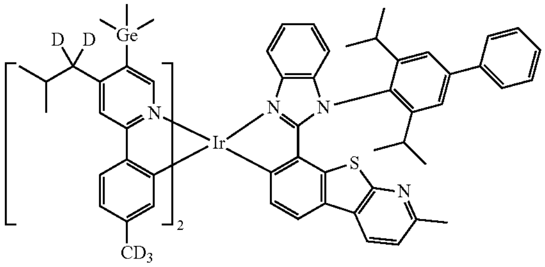
2663
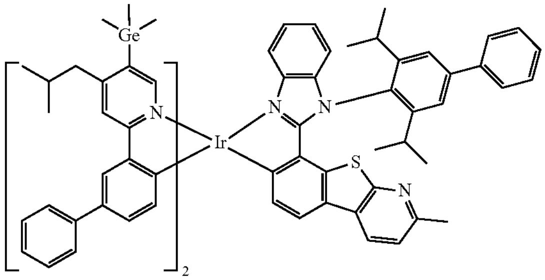
2664
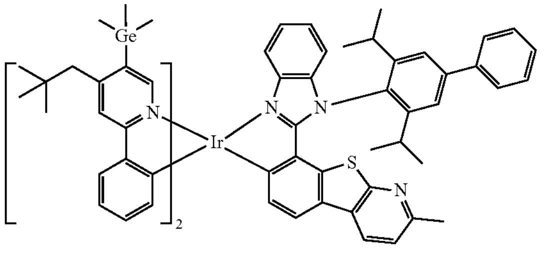
2665
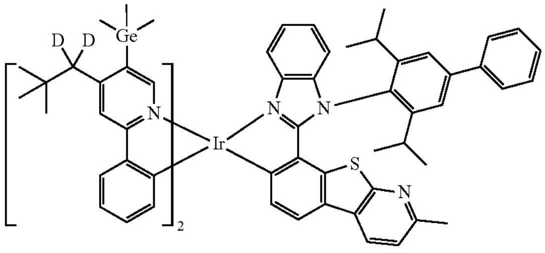

-continued
2666
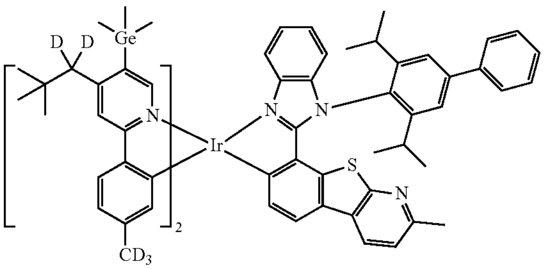
2667
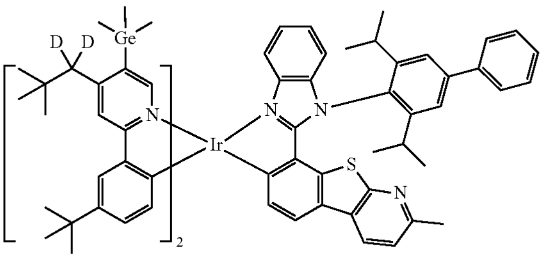
2668
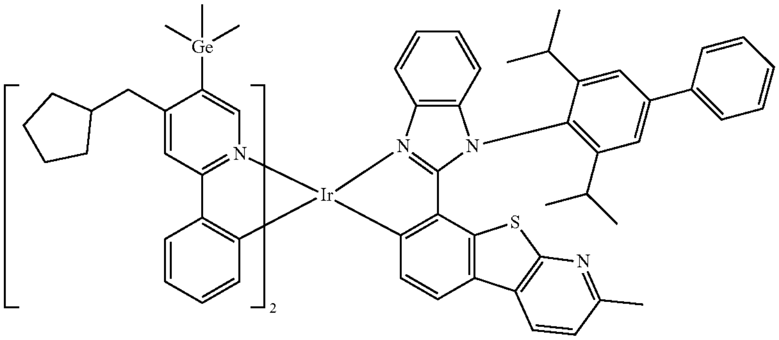
2669
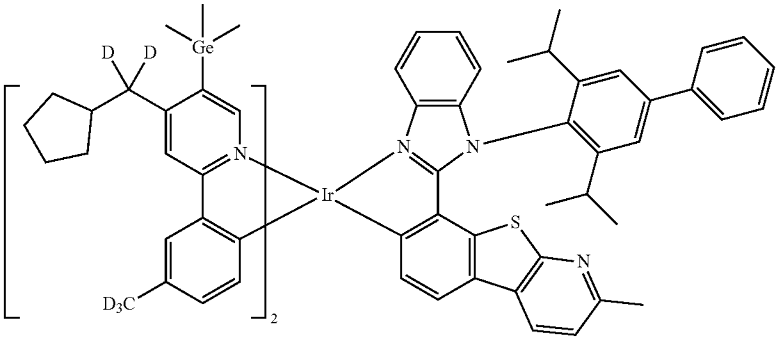
2670
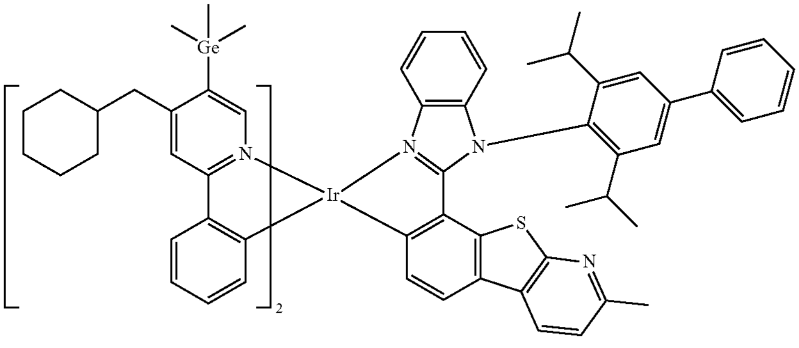

-continued
2671
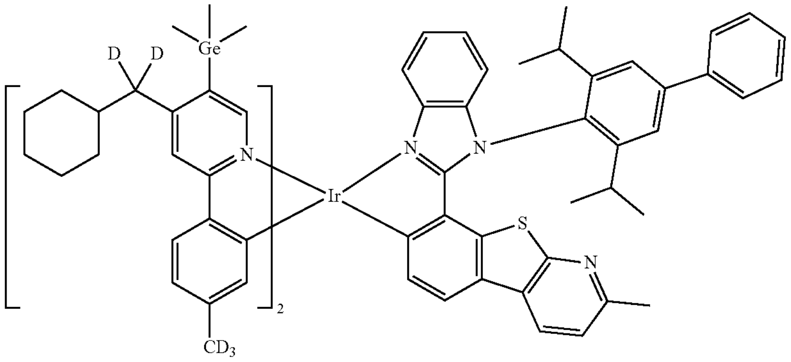
2672
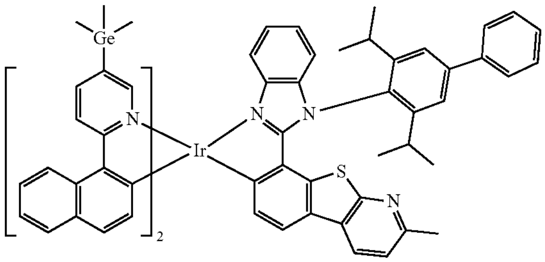
2673
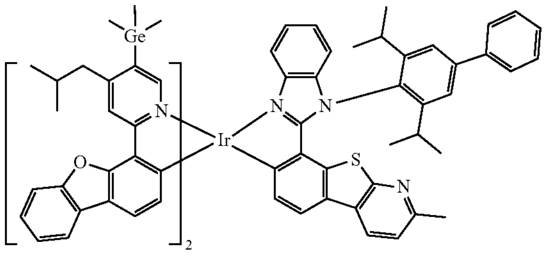
2674
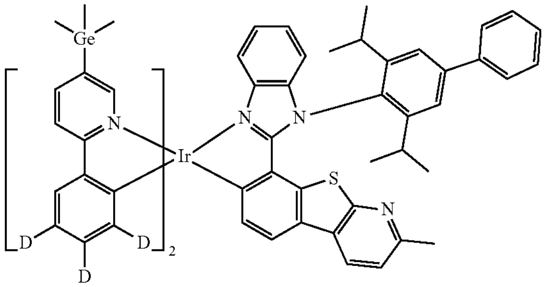
2675
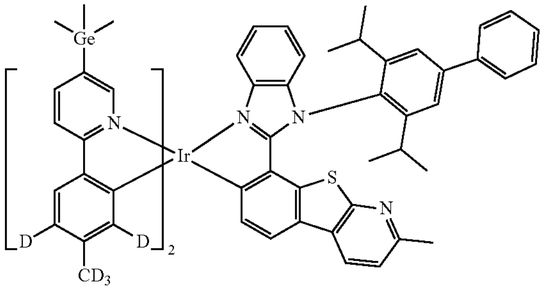
2676
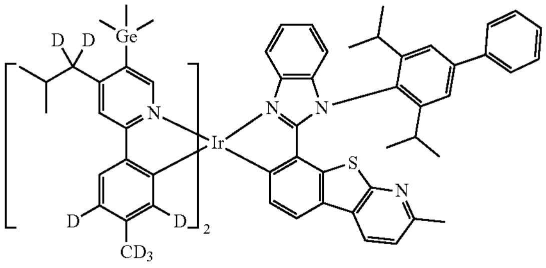
2677
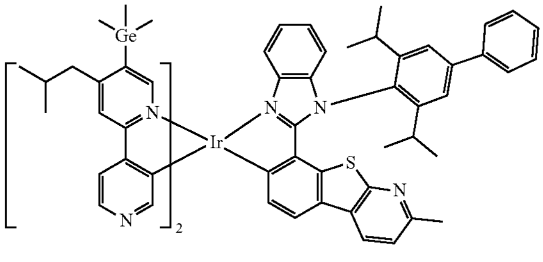
2678
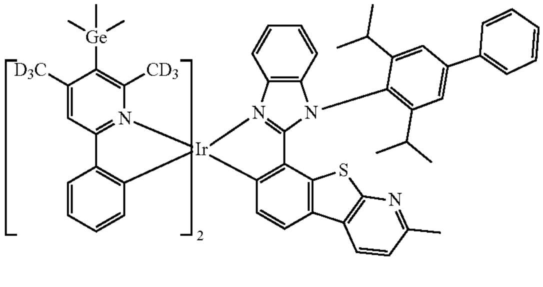
2679
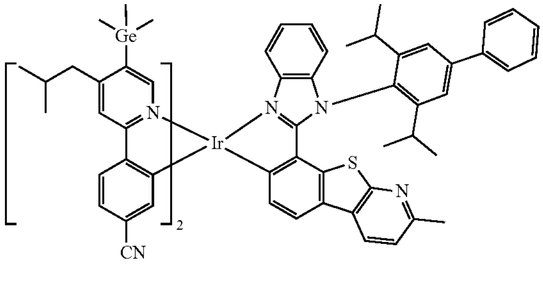

-continued
2680
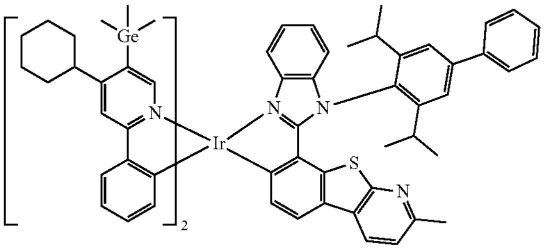
2681
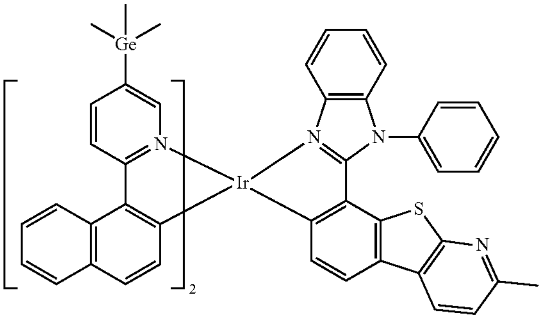
2682
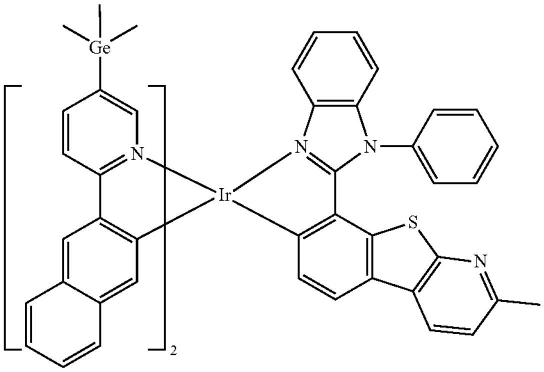
2683
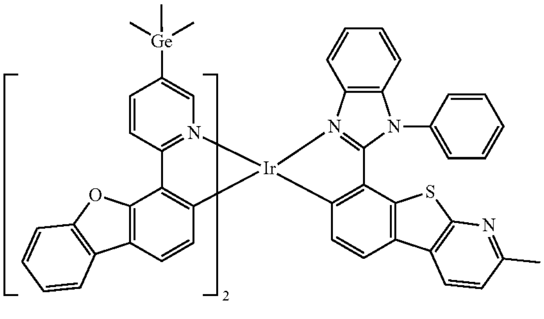
2684
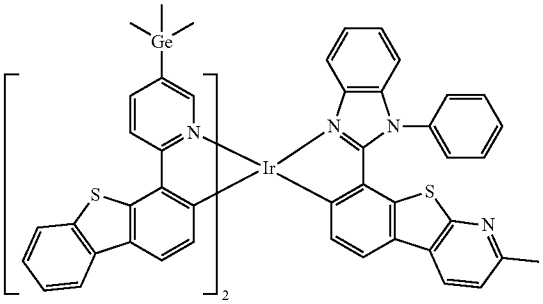
2685
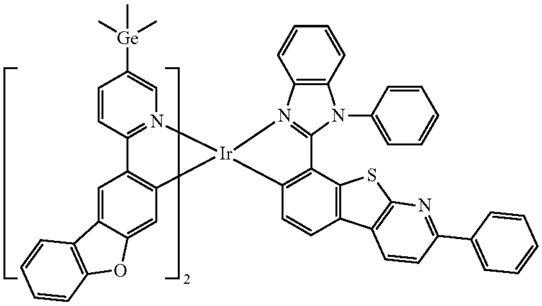
2686
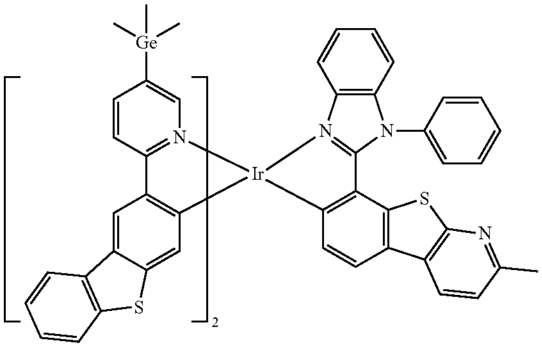
2687
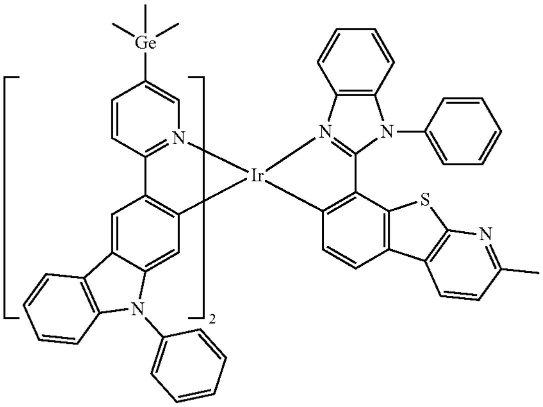

-continued
2688
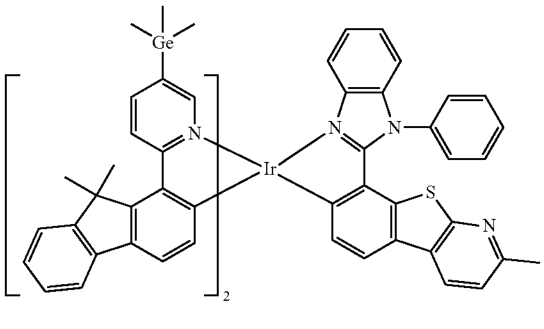
2689
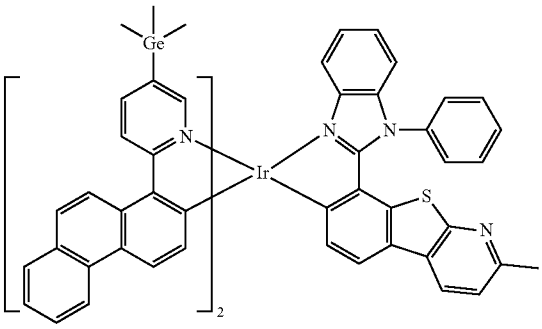
2690
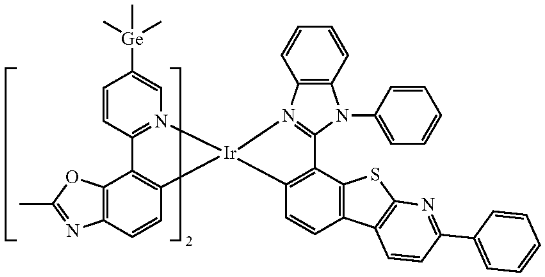
2691
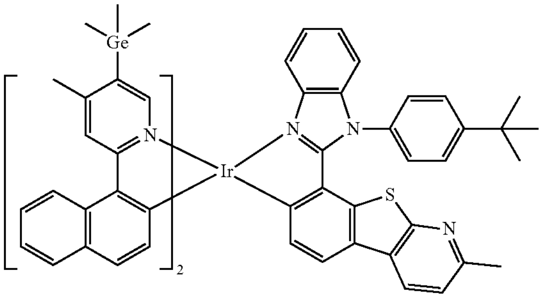
2692
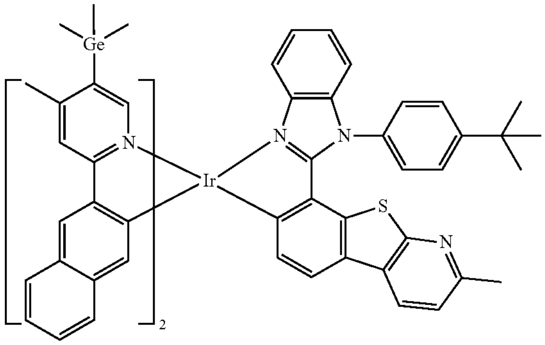
2693
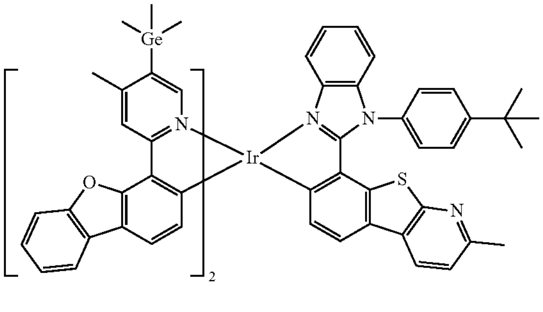
2694
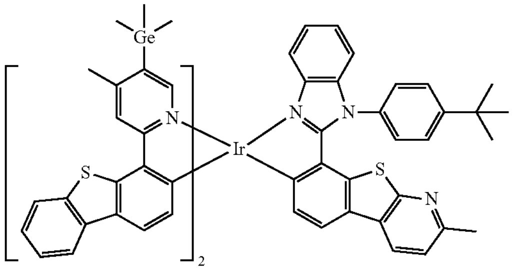
2695
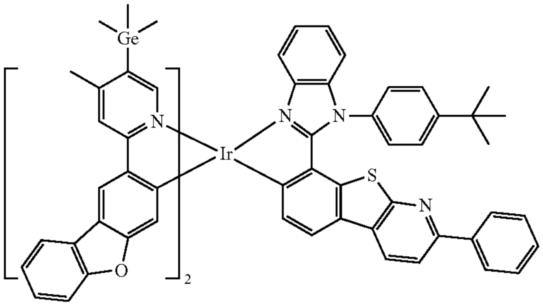

-continued
2696
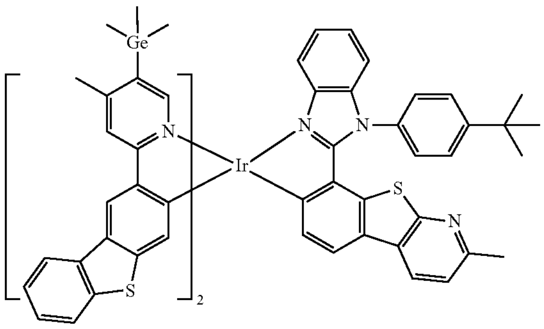
2697
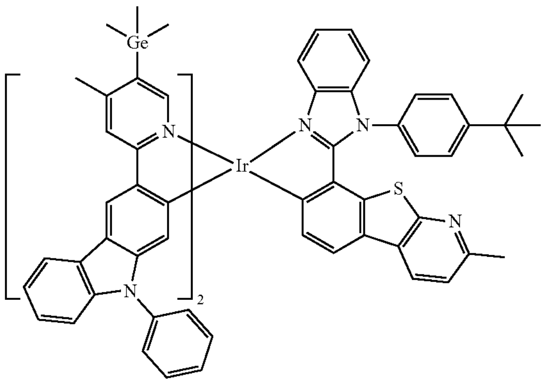
2698
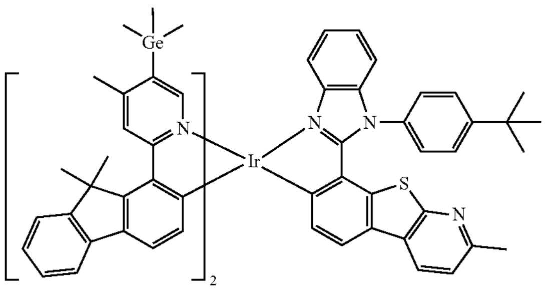
2699
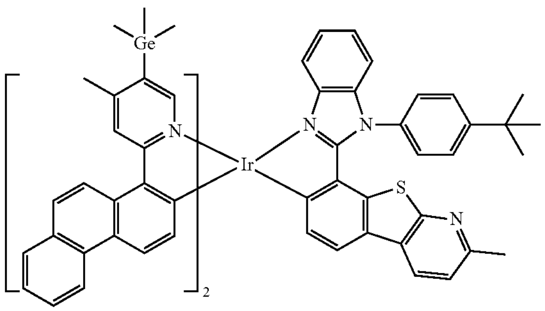
2700
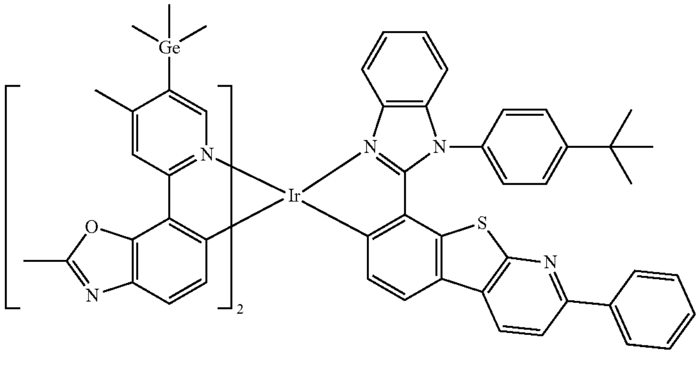

-continued
2701
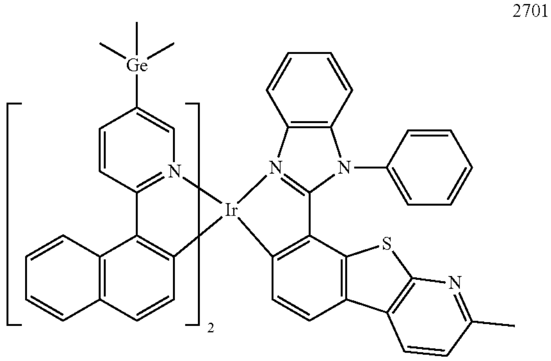
2702
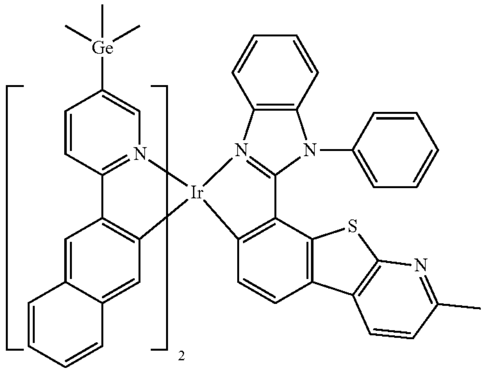
2703
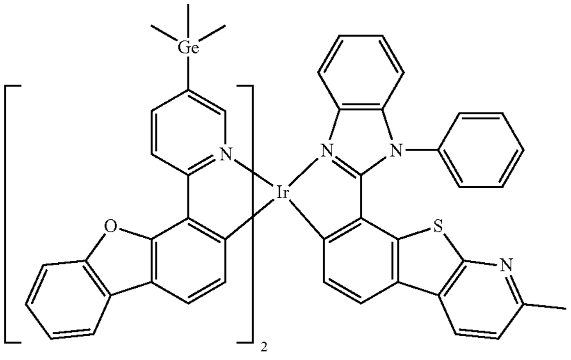
2704
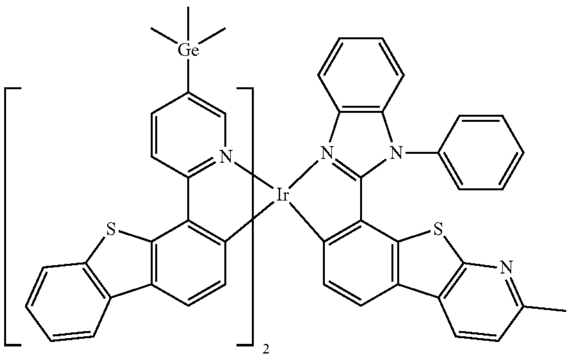
2705
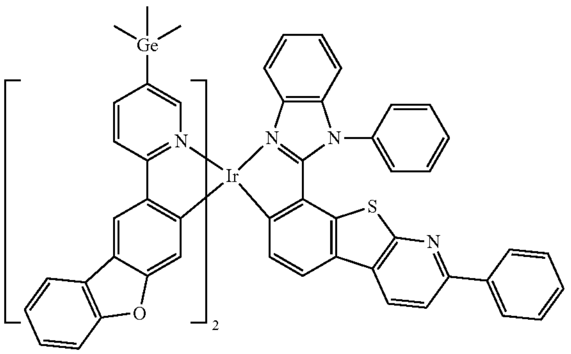
2706
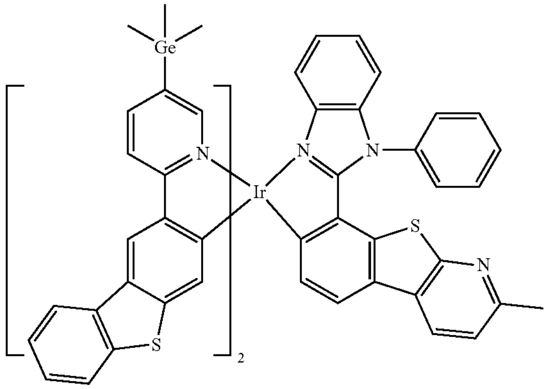
2707
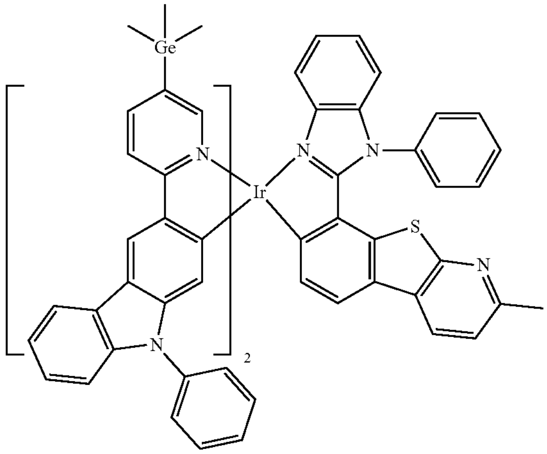
2708
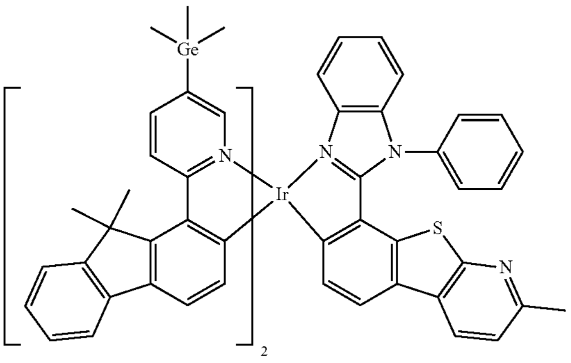

-continued
2709
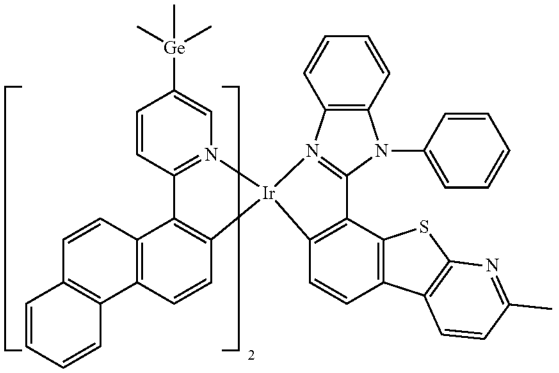
2710
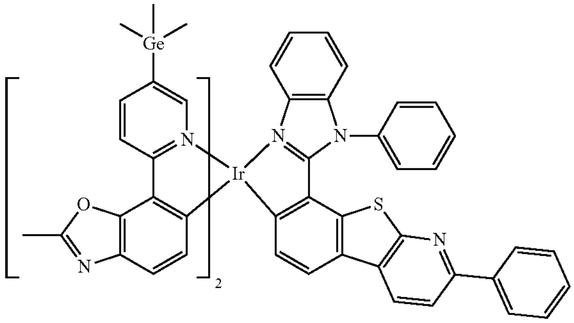
2711
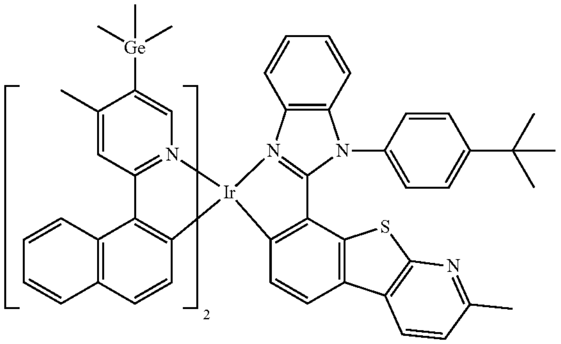
2712
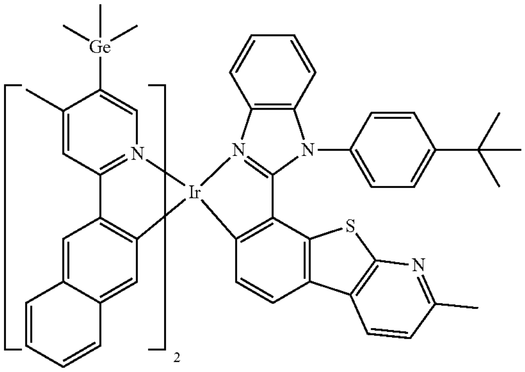
-continued
2713
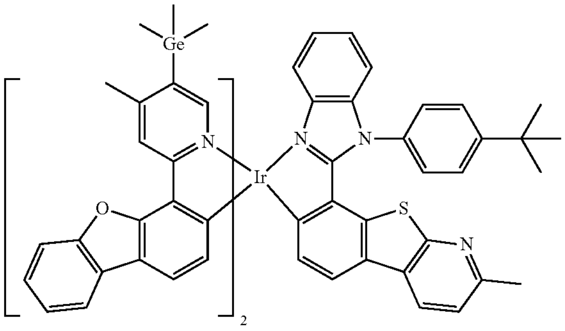
2714
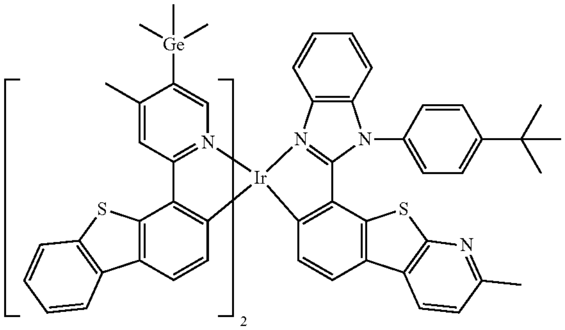
2715
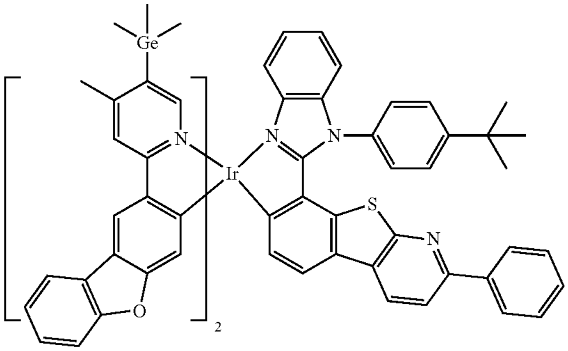
2716
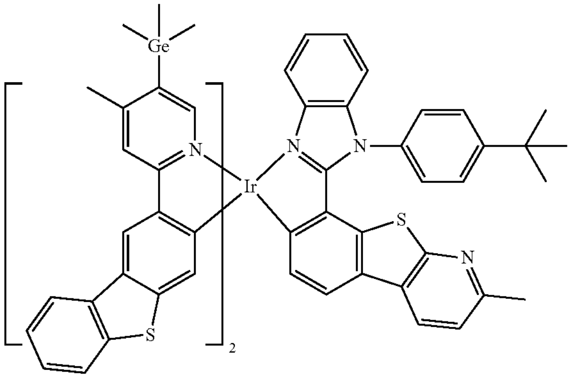

-continued
2717
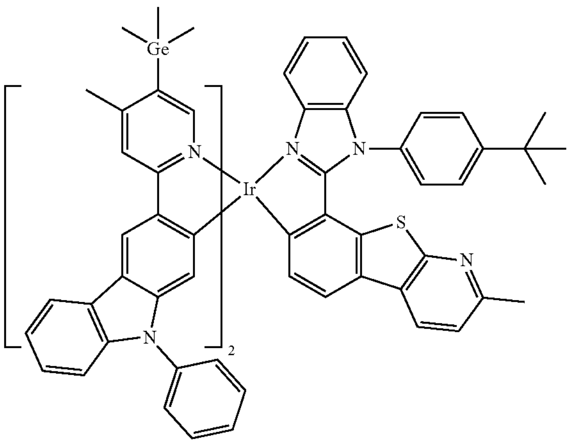
2718
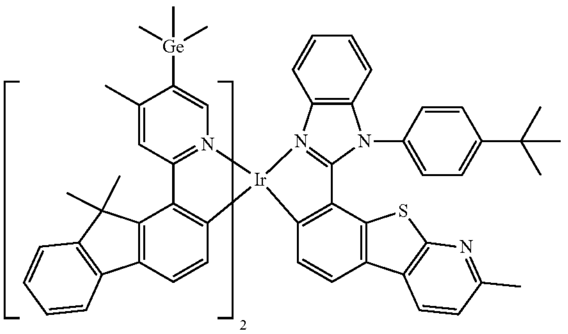
2719
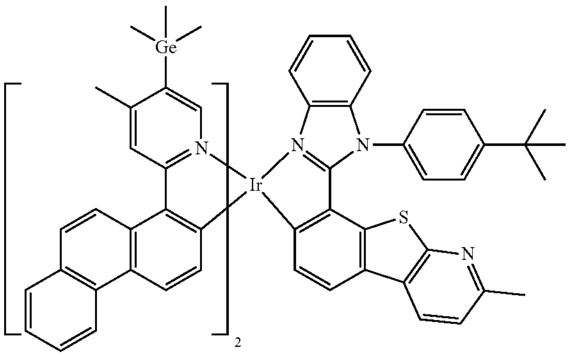
2720
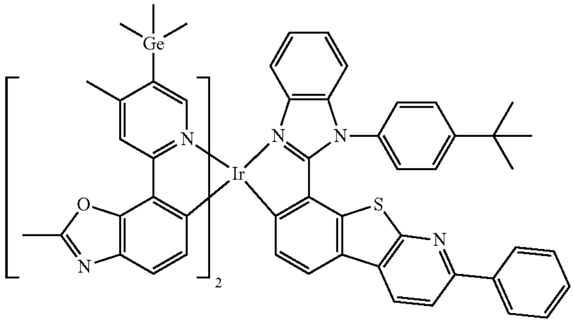
-continued
2721
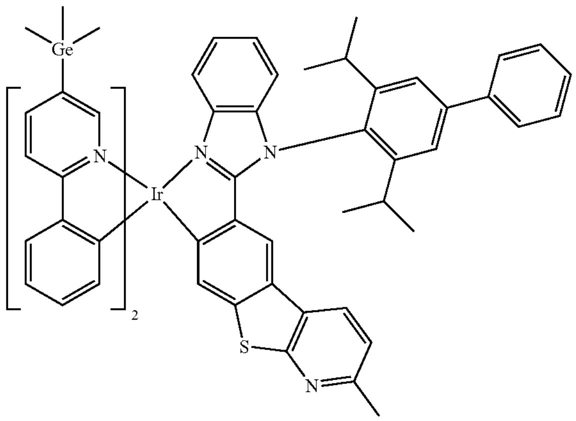
2722
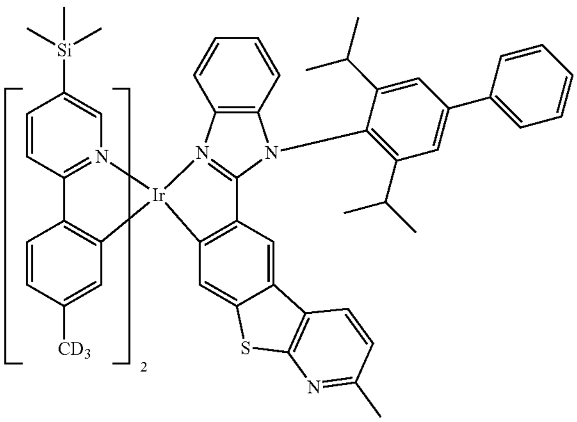
2723
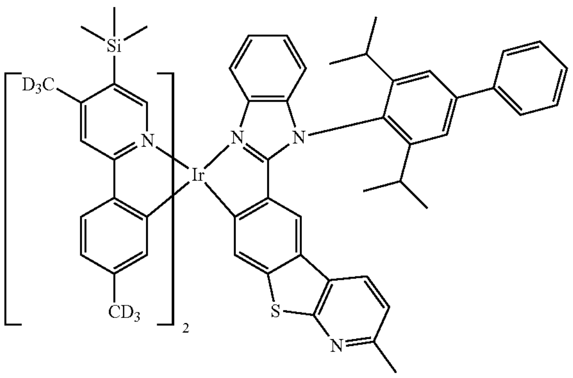

-continued
2724
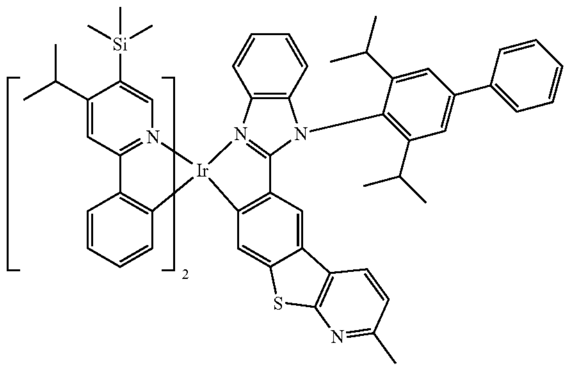
2725
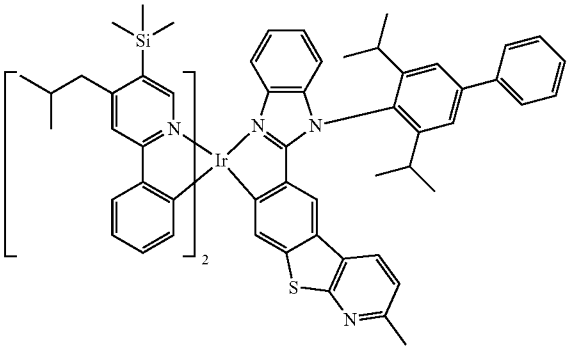
2725
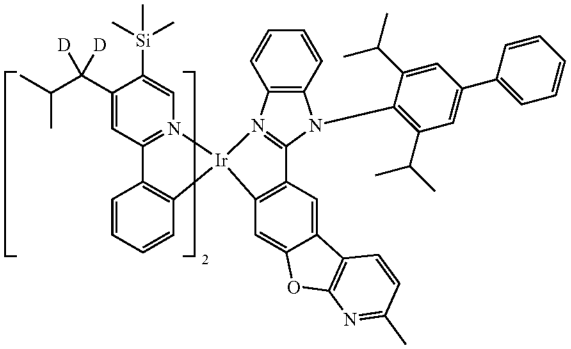
2727
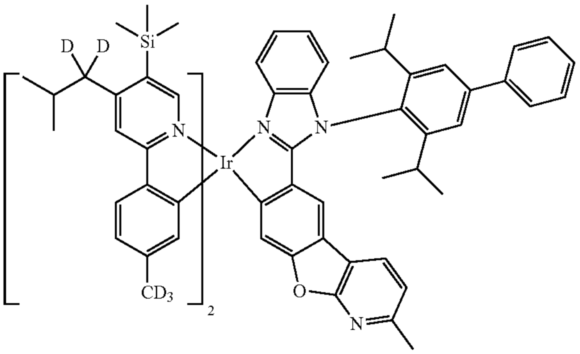
-continued
2728
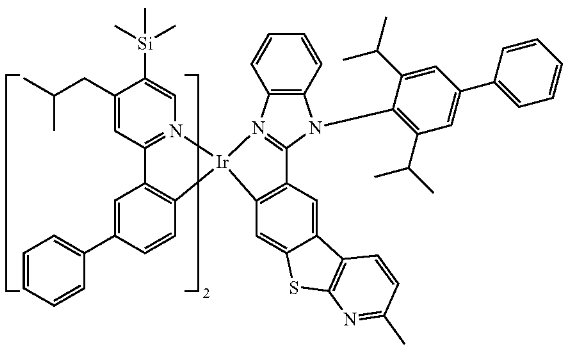
2729
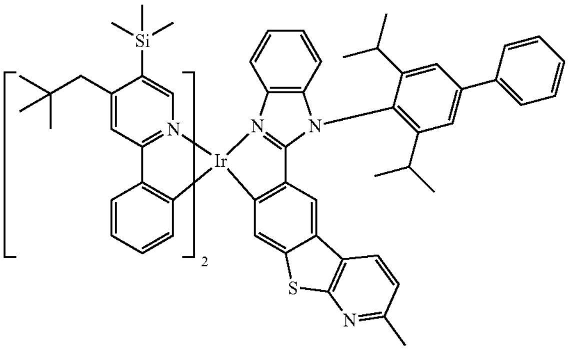
2730
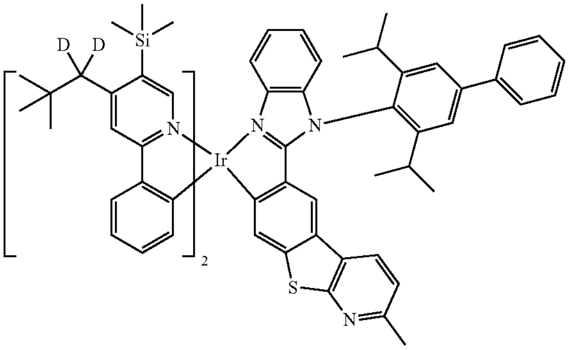
2731
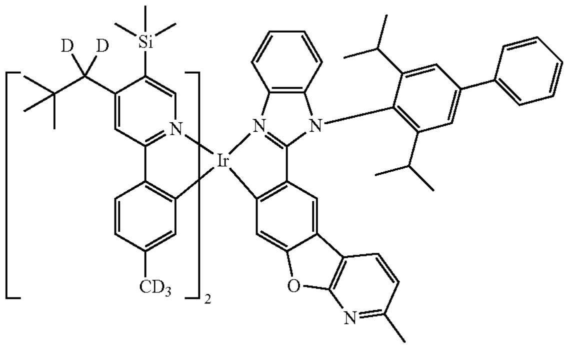

-continued
2732
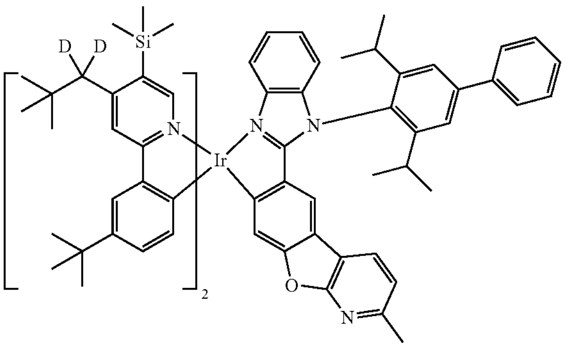
2733
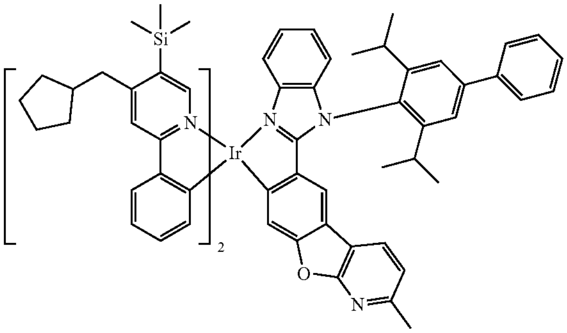
2734
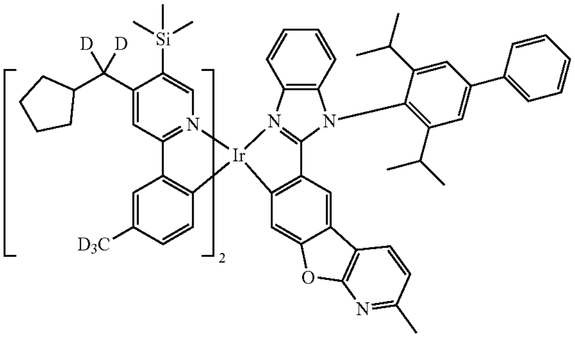
2735
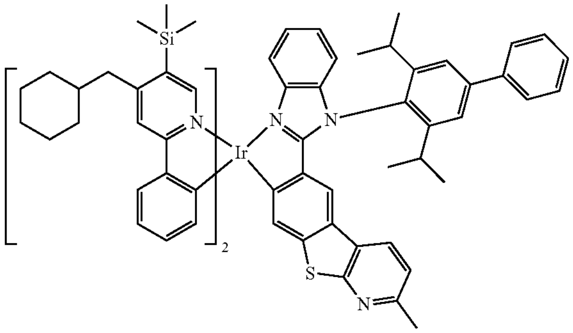
-continued
2736
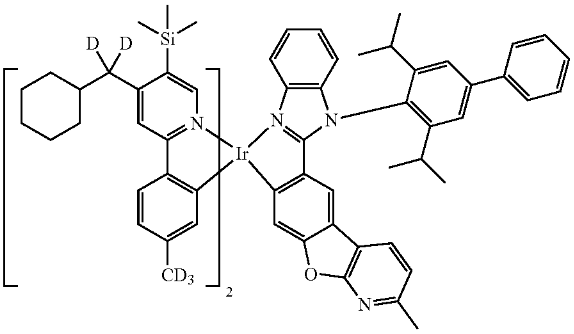
2737
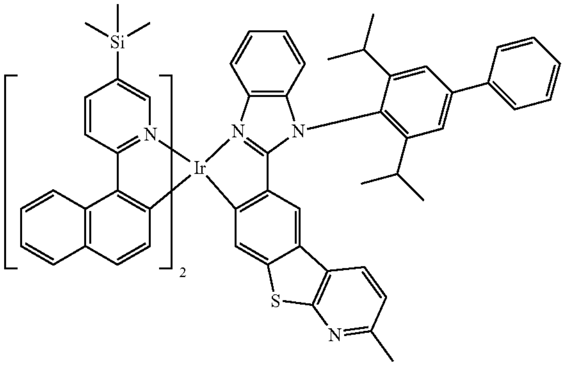
2738
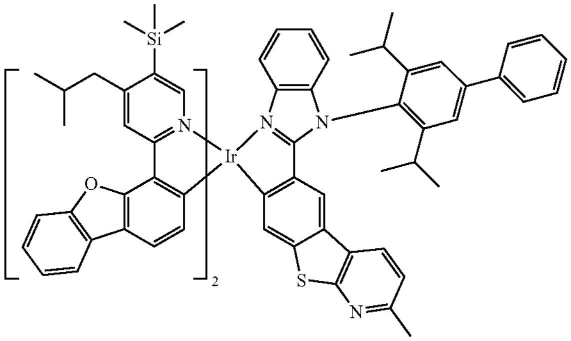
2739
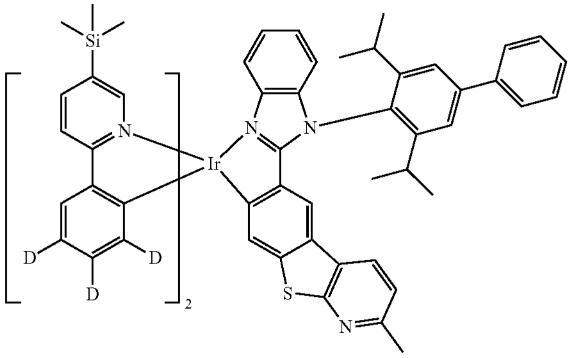

-continued
2740
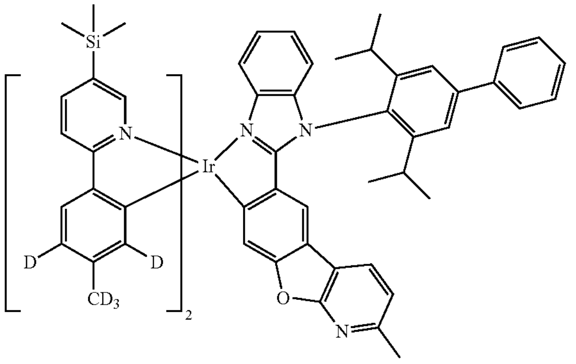
2741
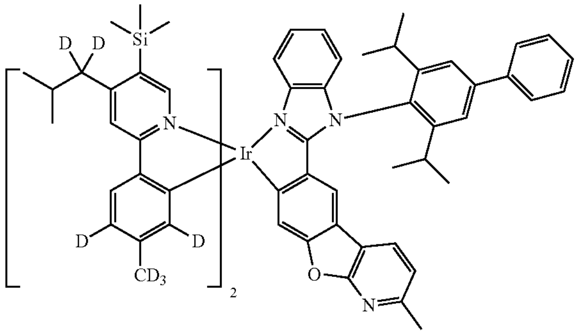
2742
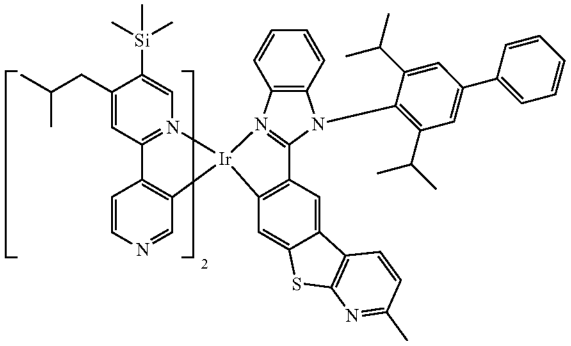
2743
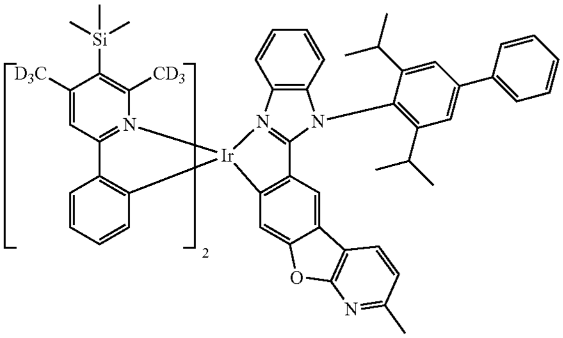
-continued
2744
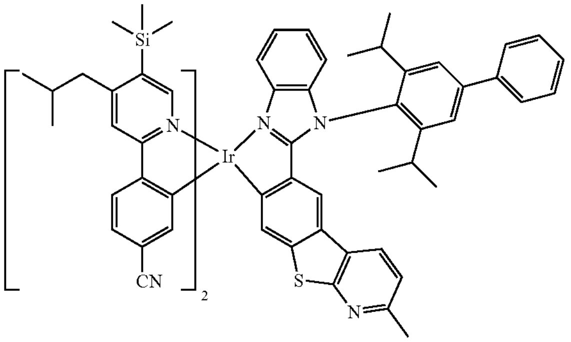
2745
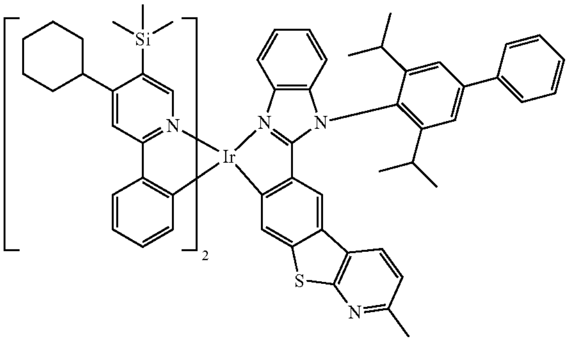
2746
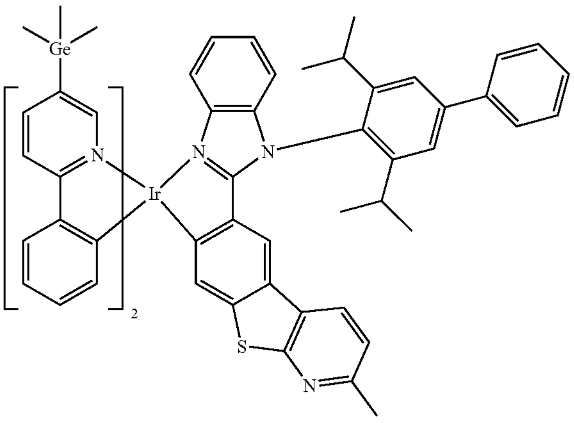
2747
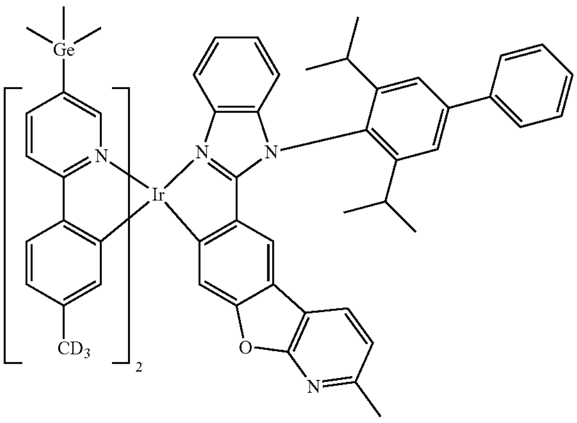

-continued
2748
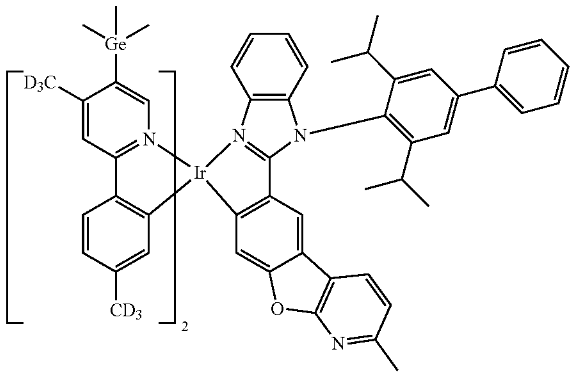
2749
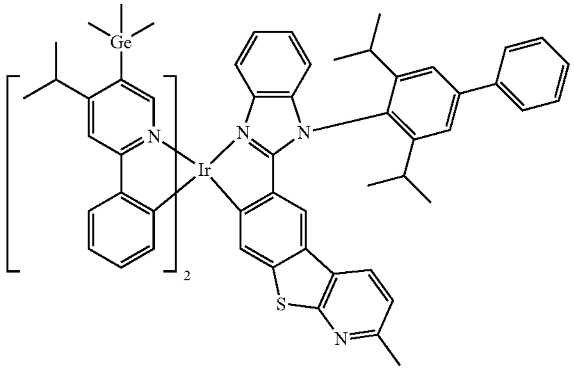
2750
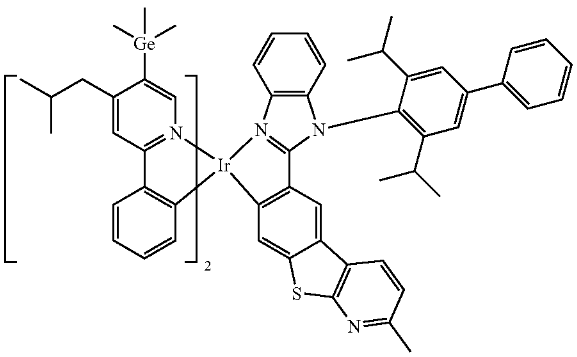
2751
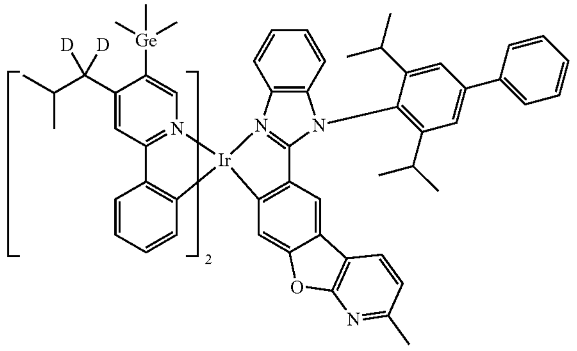
-continued
2752
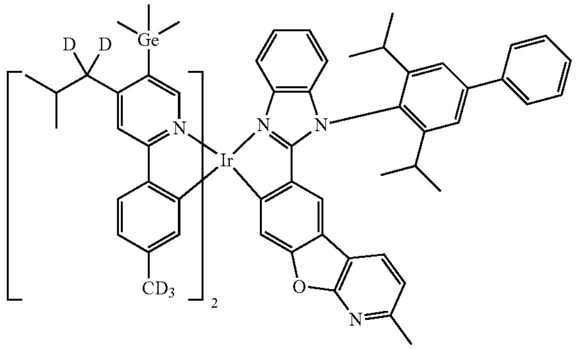
2753
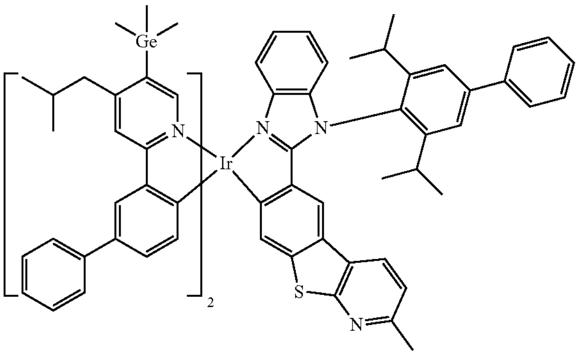
2754
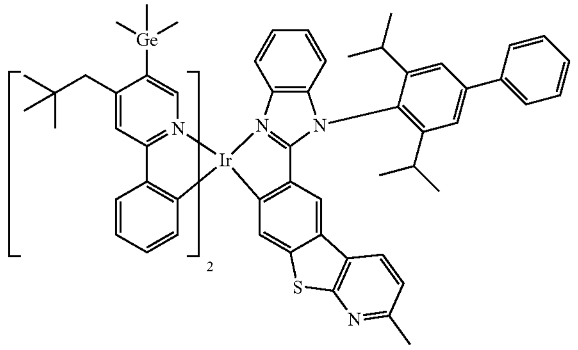
2755
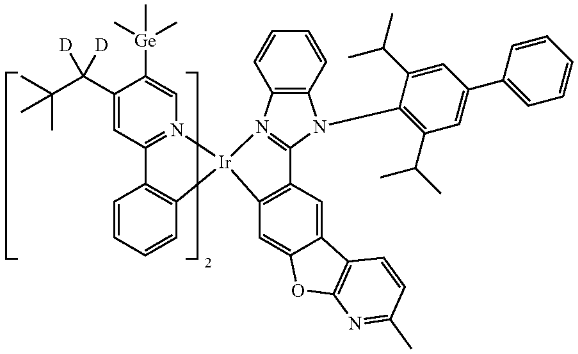

2756
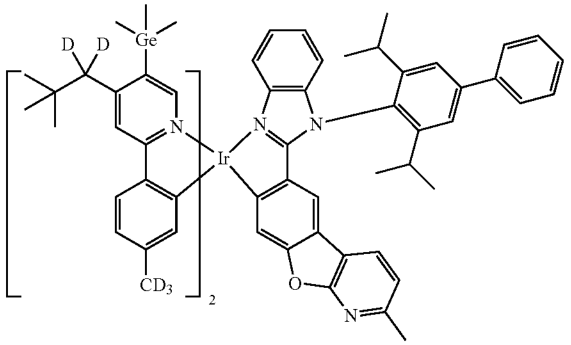
2757
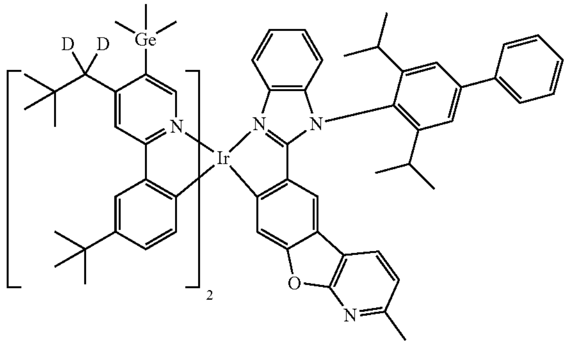
2758
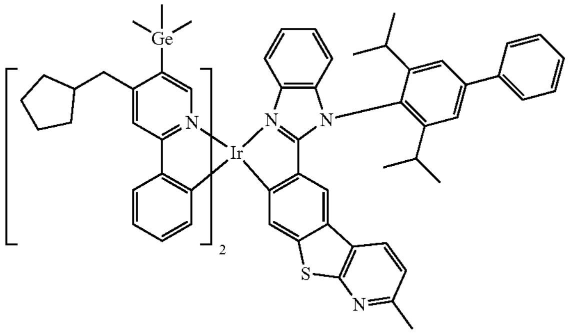
2759
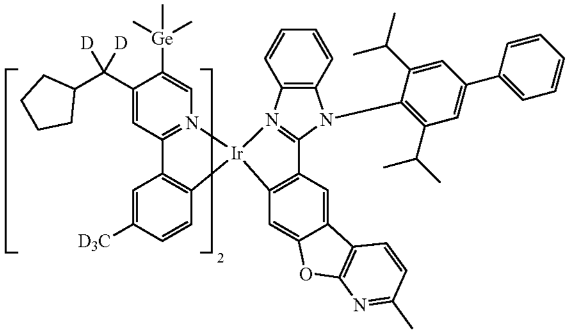
2760
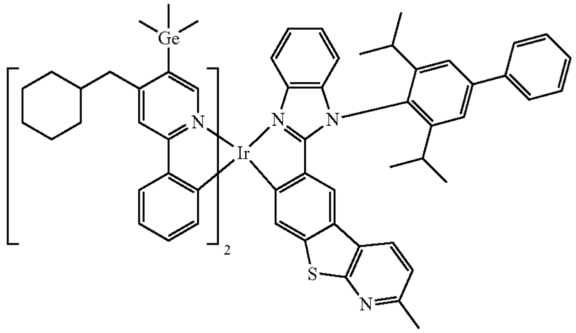
2761
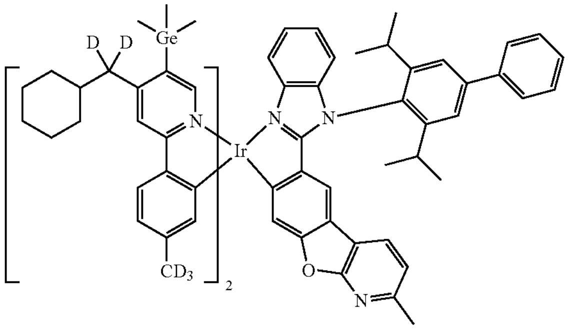
2762
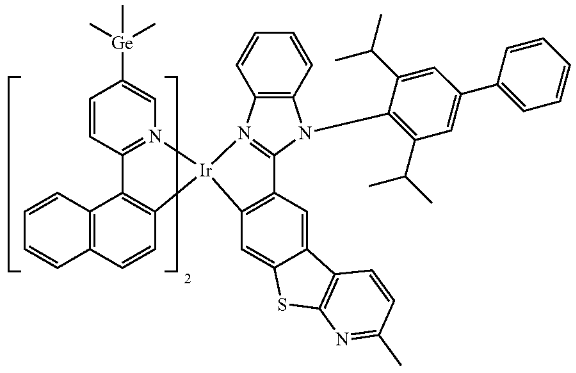
2763
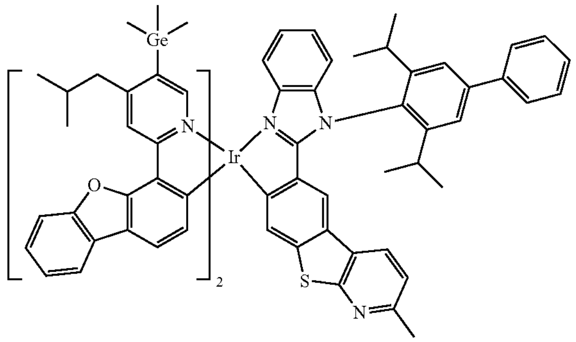

-continued
2764
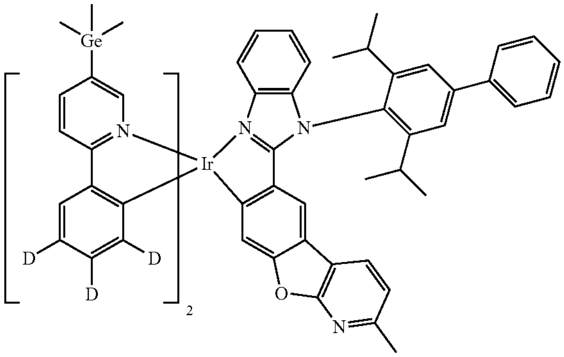
2765
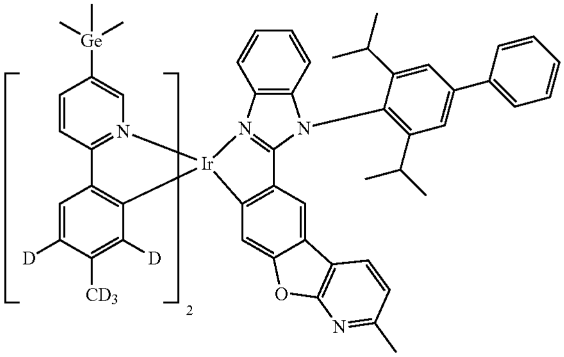
2766
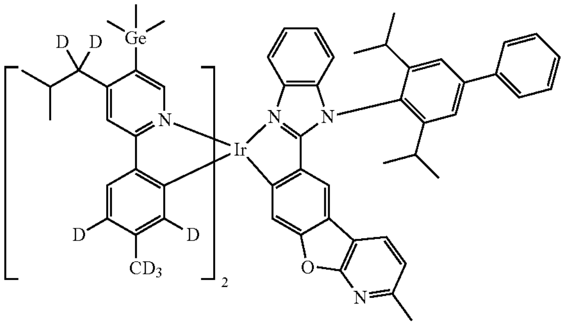
2767
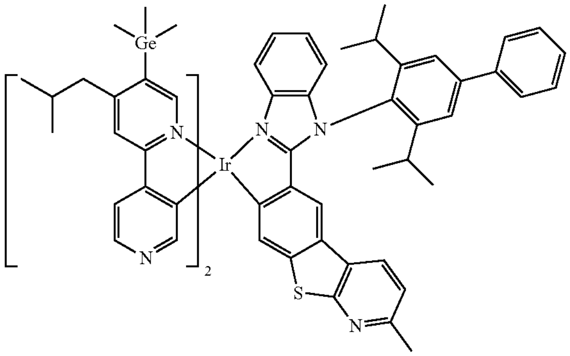
-continued
2768
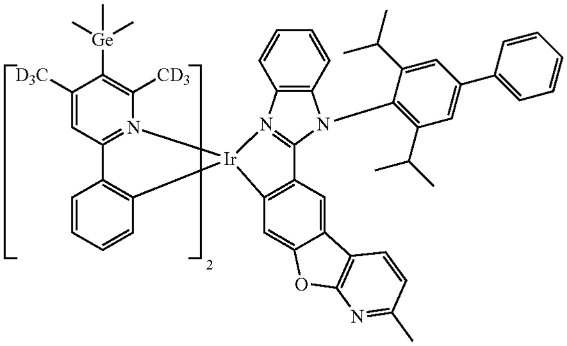
2769
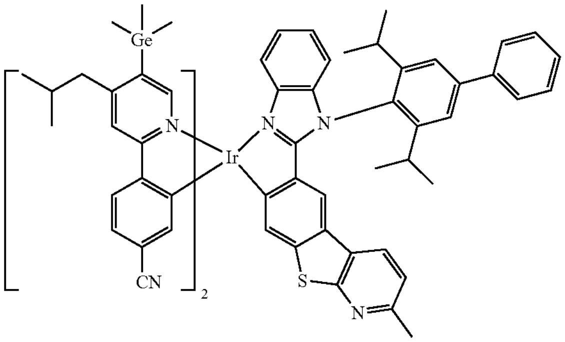
2770
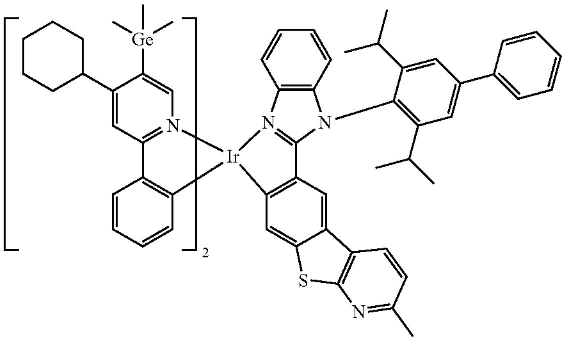
2771
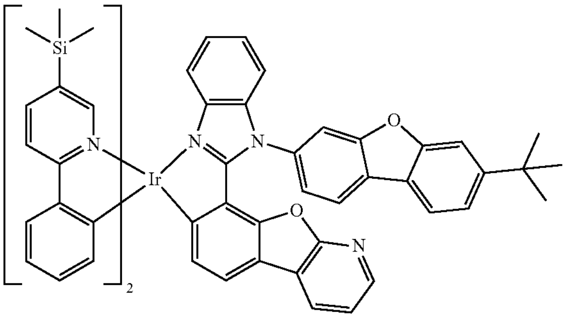

-continued
2772
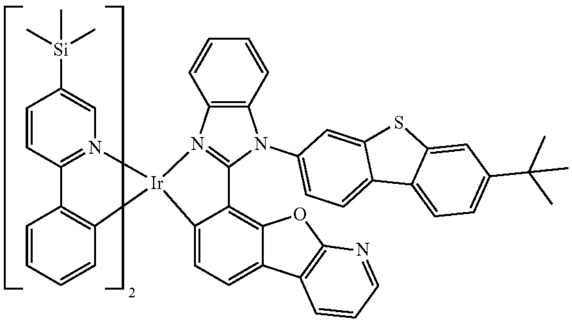
2773
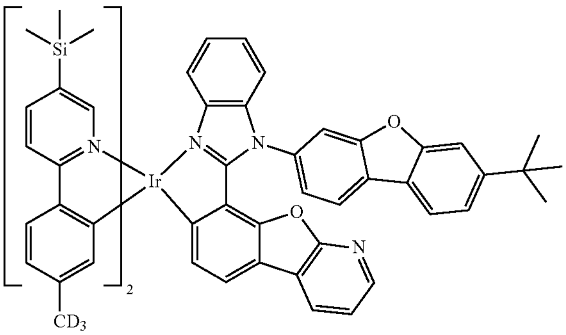
2774
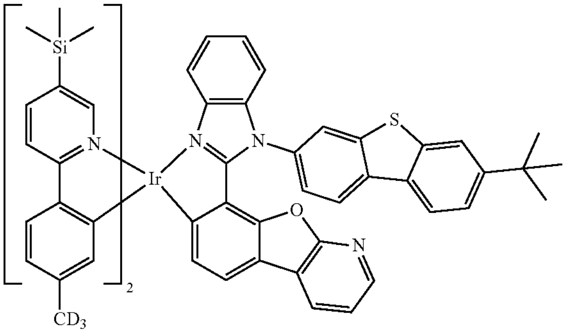
2775
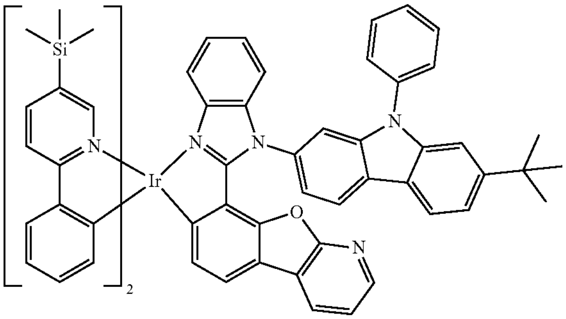
-continued
2776
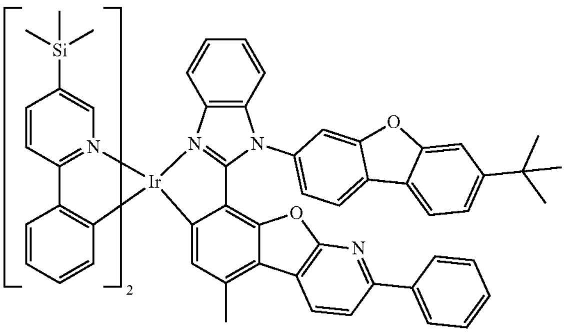
2777
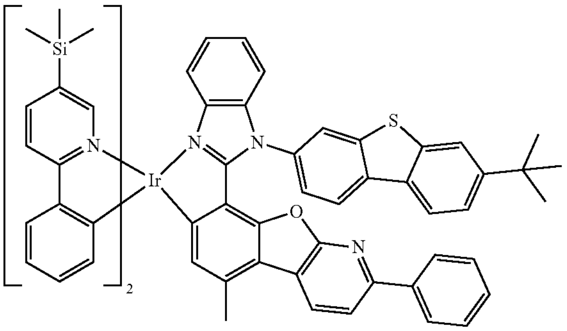
2778
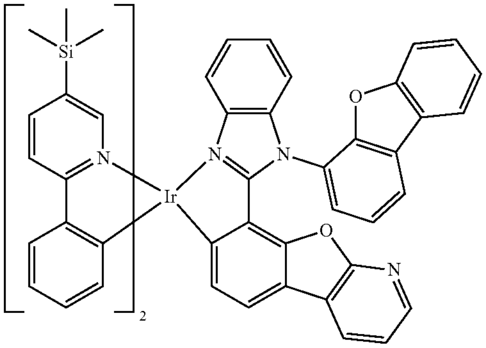
2779
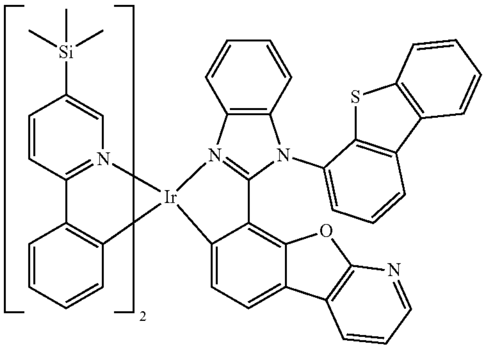

-continued
2780
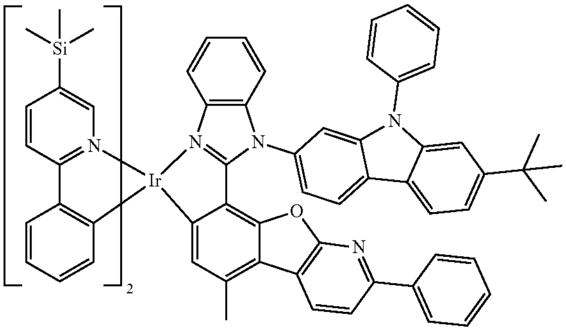
2781
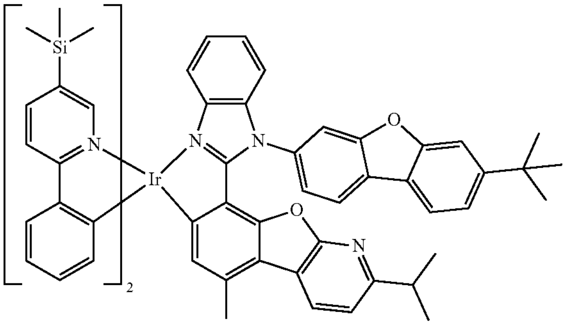
2782
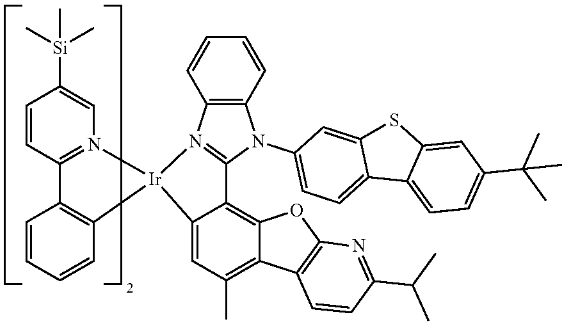
2783
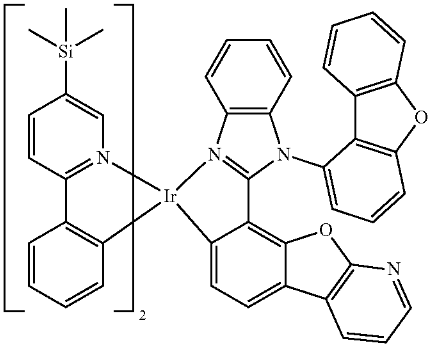
-continued
2784
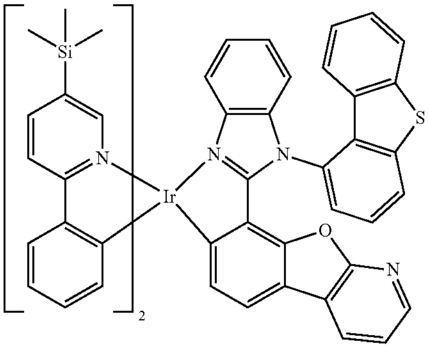
2785
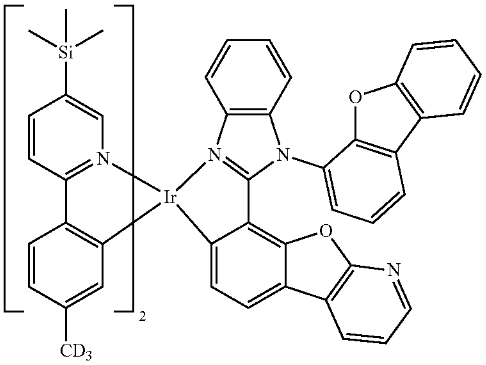
2786
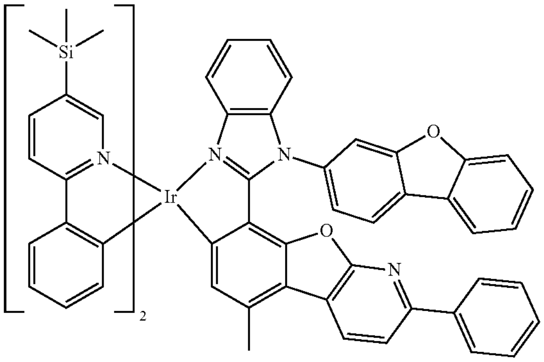
2787
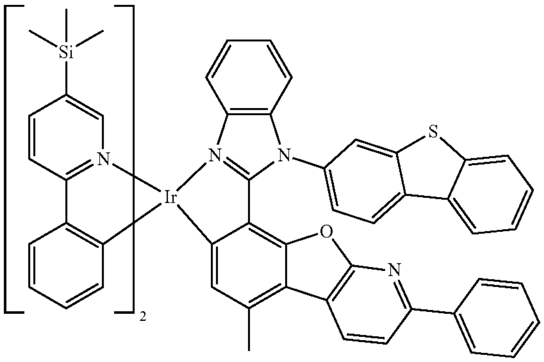

-continued
2788
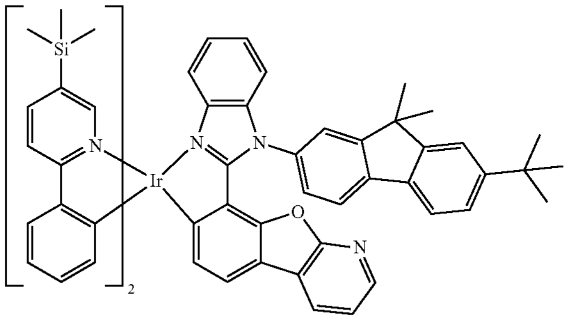
2789
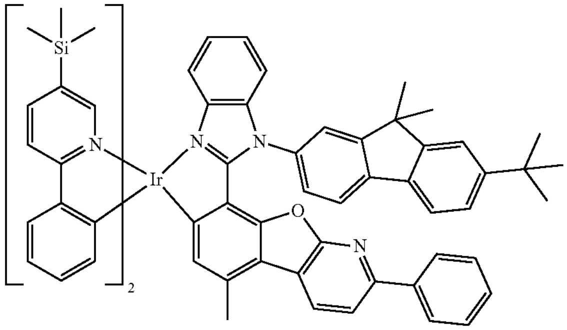
2790
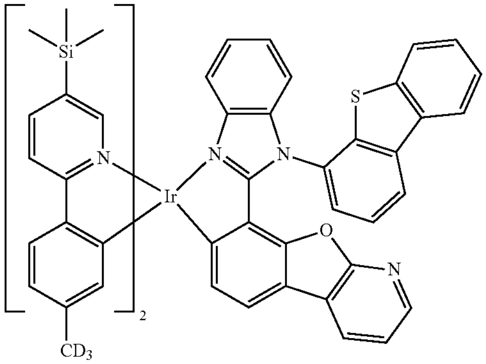
2791
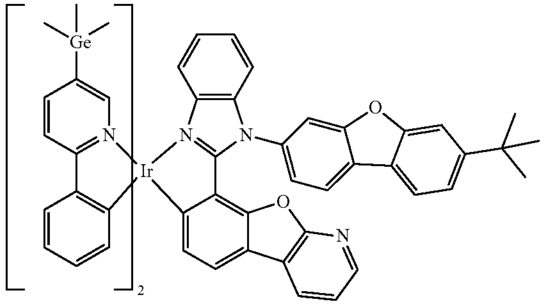
-continued
2792
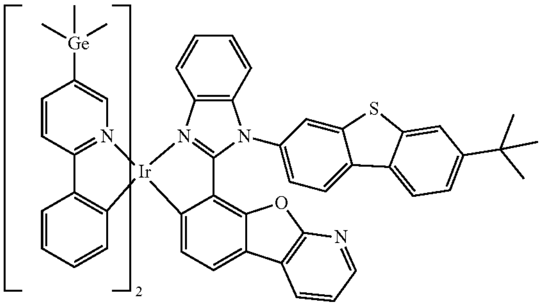
2793
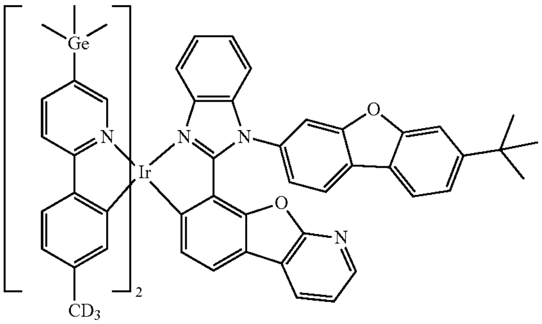
2794
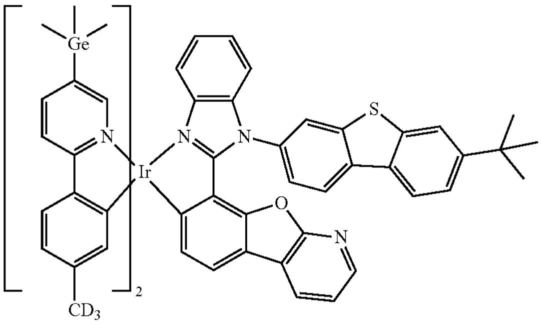
2795
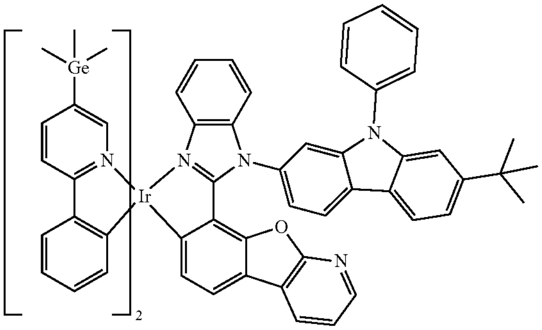

-continued
2796
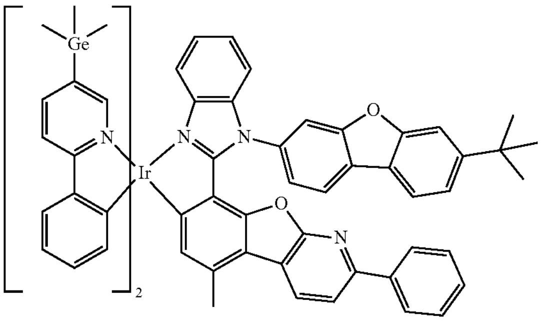
2797
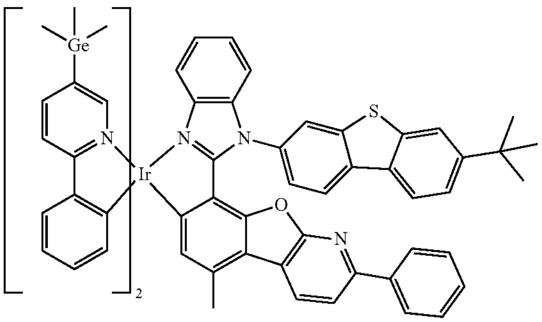
2798
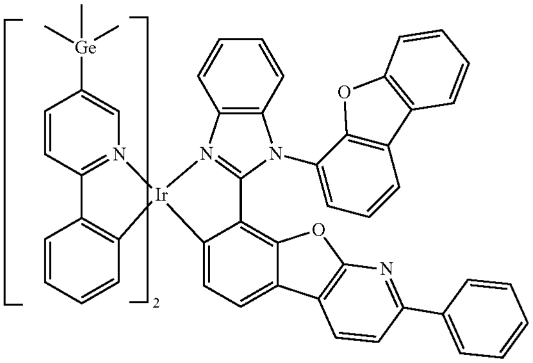
2799
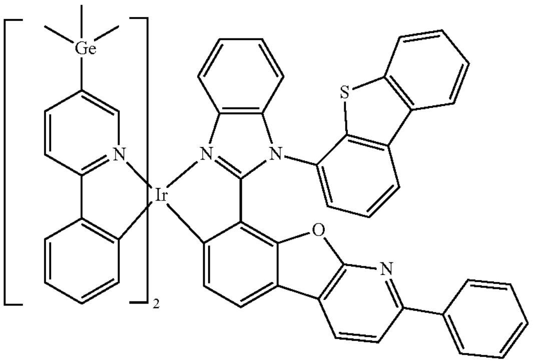
2800
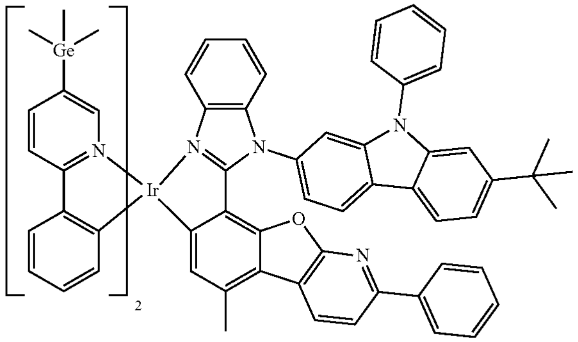
2801
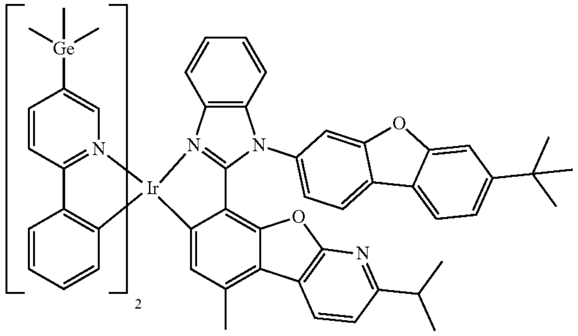
2802
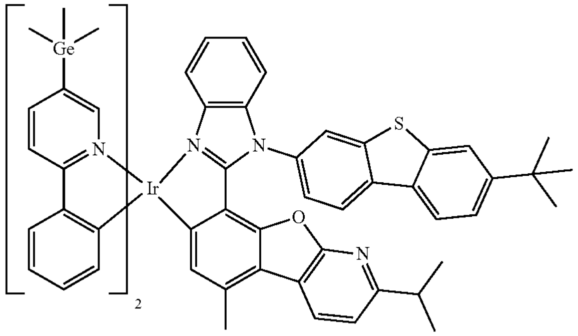
2803
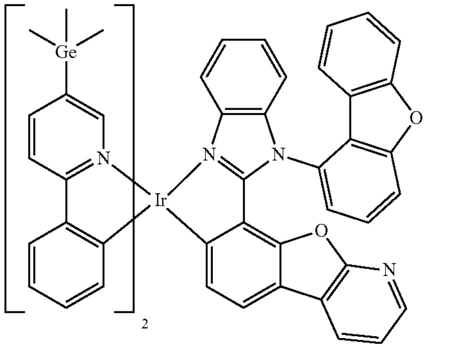

-continued
2804
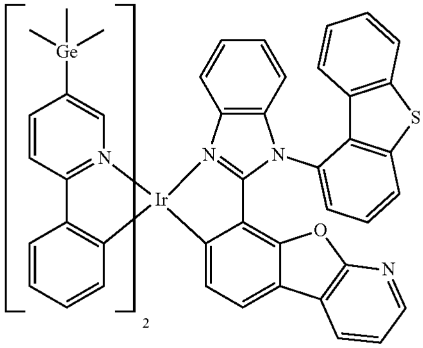
2805
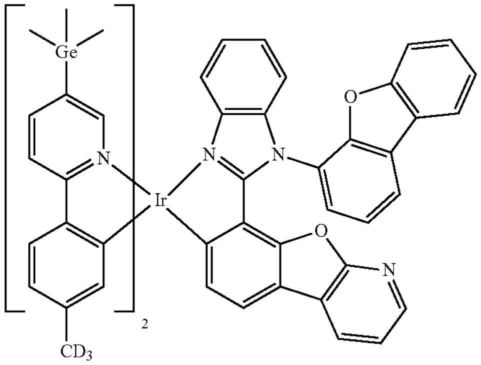
2806
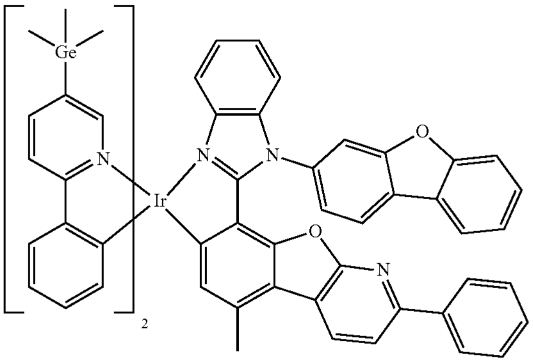
2807
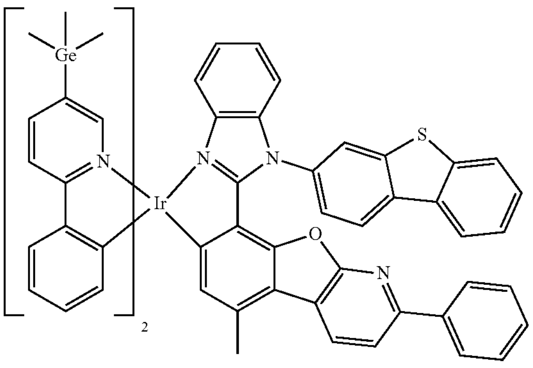
-continued
2808
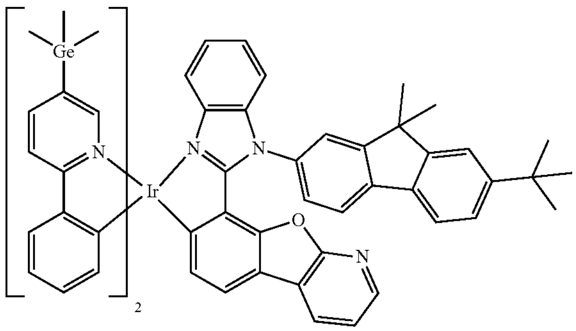
2809
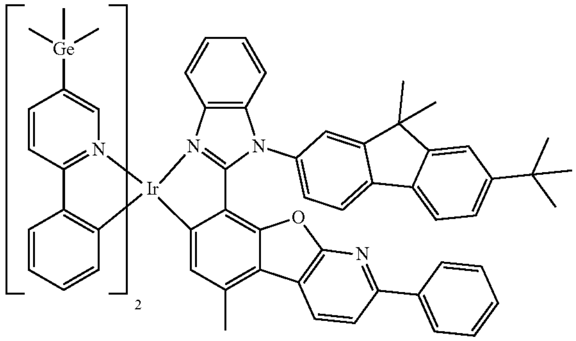
2810
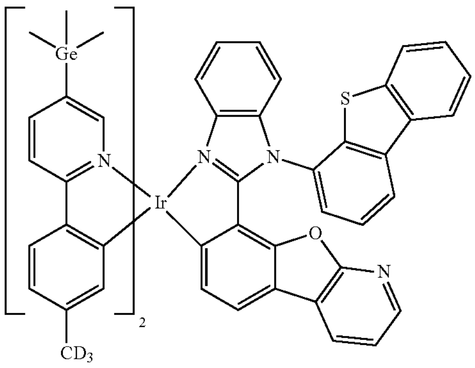
2811
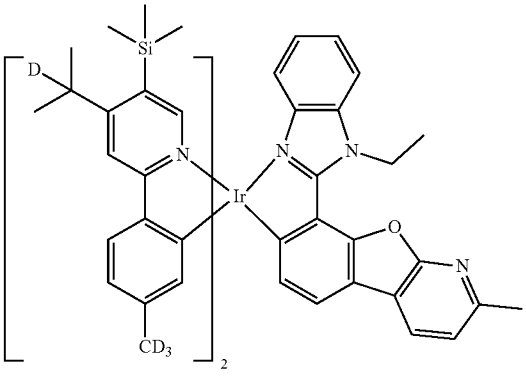

-continued
2812
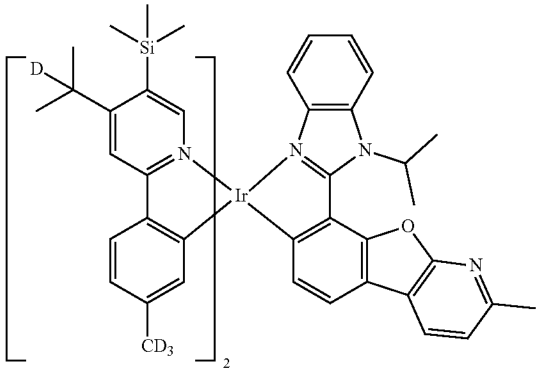
2813
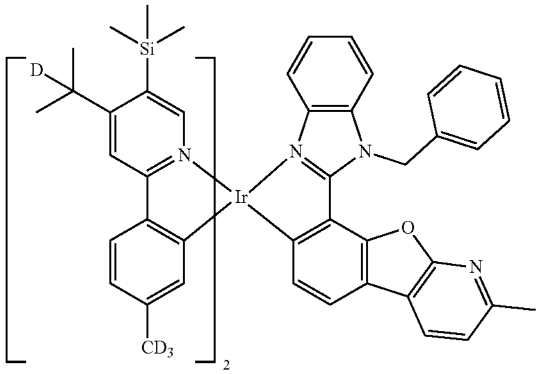
2814
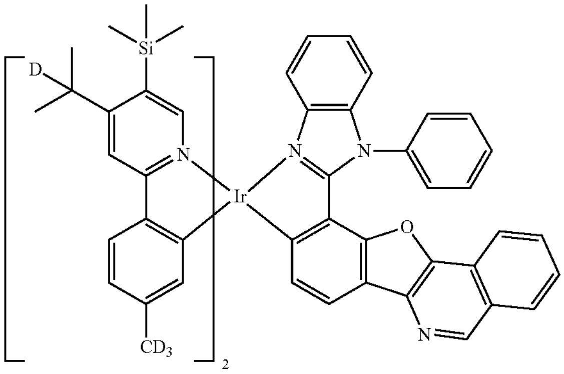
2815
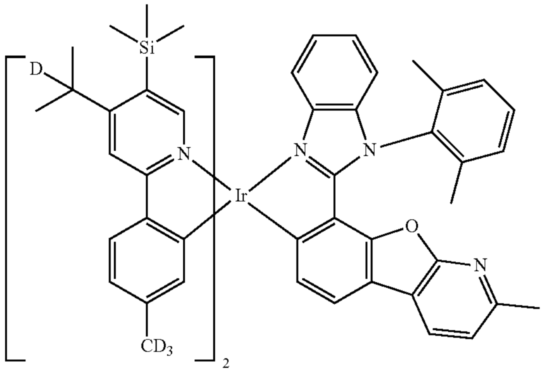
-continued
2816
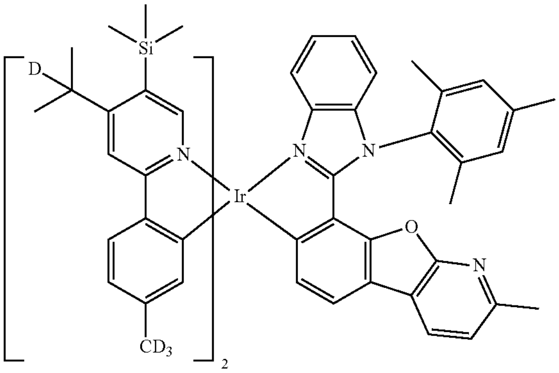
2817
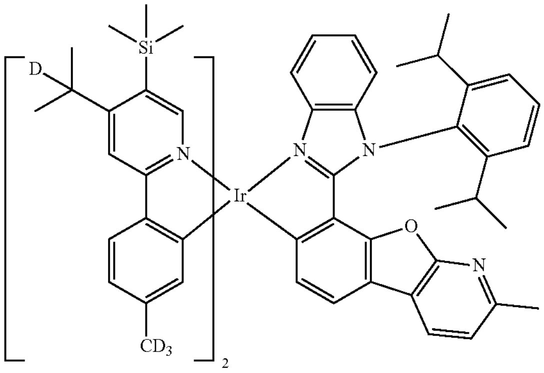
2818
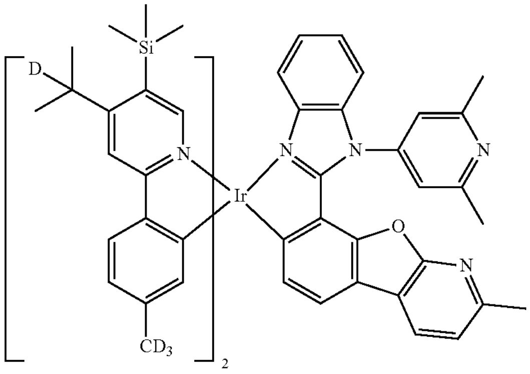
2819
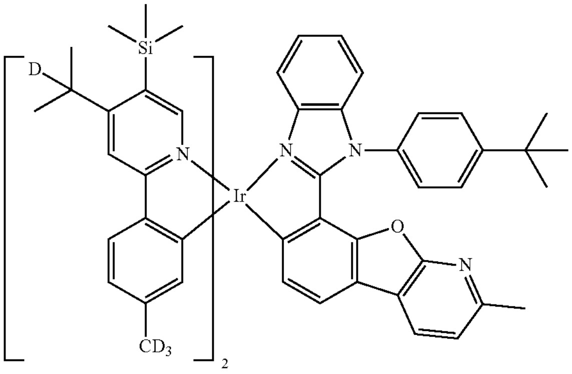

-continued
2820
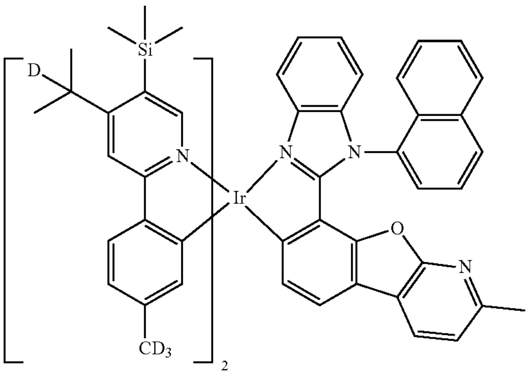
2821
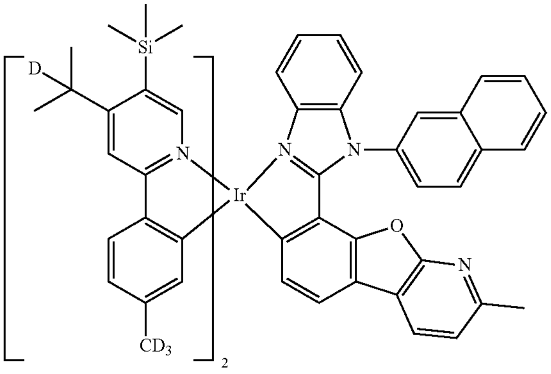
2822
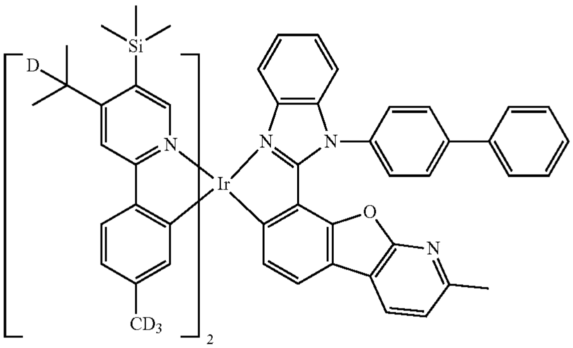
2823
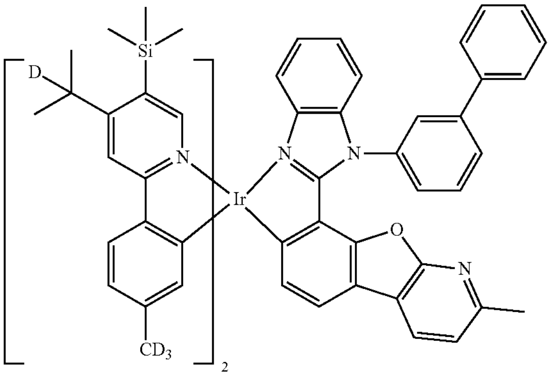
-continued
2824
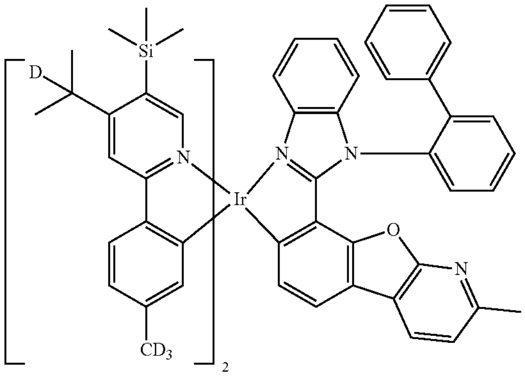
2825
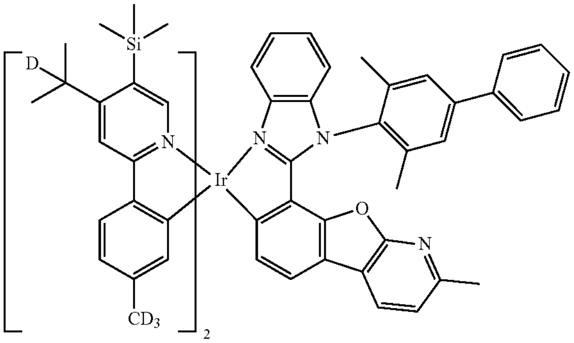
2826
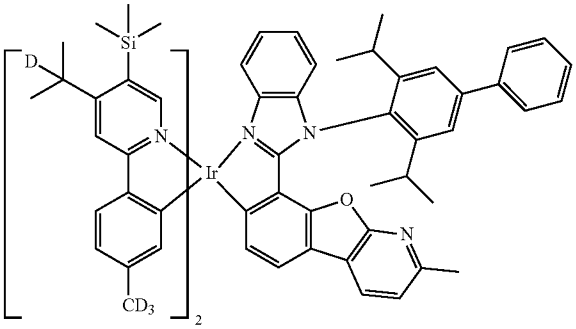
2827
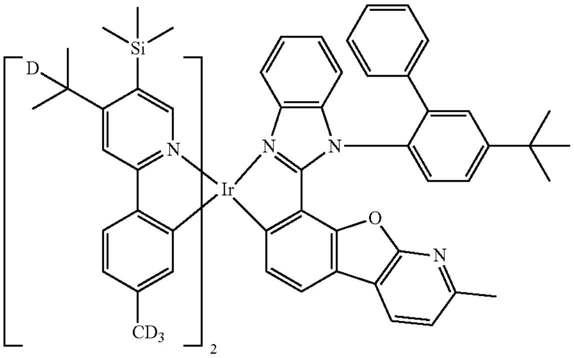

-continued
2828
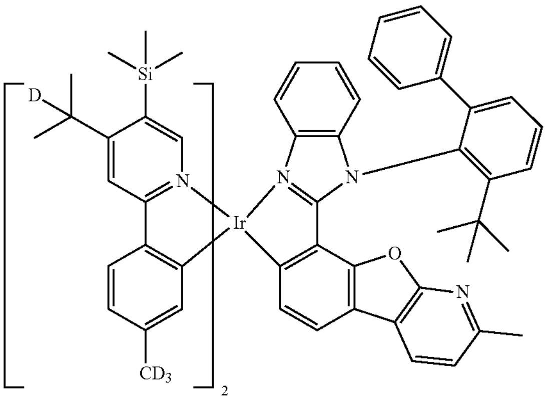
2829
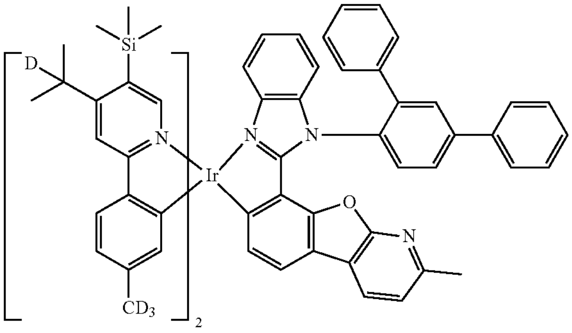
2830
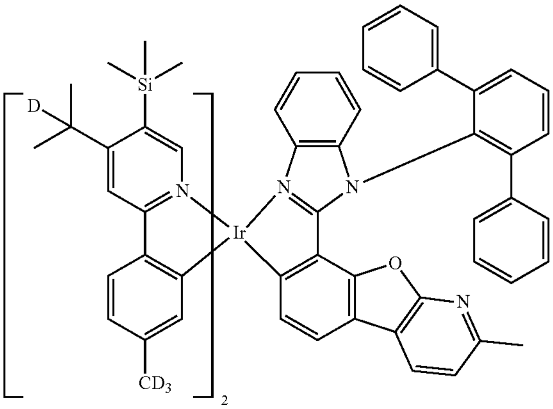
-continued
2831
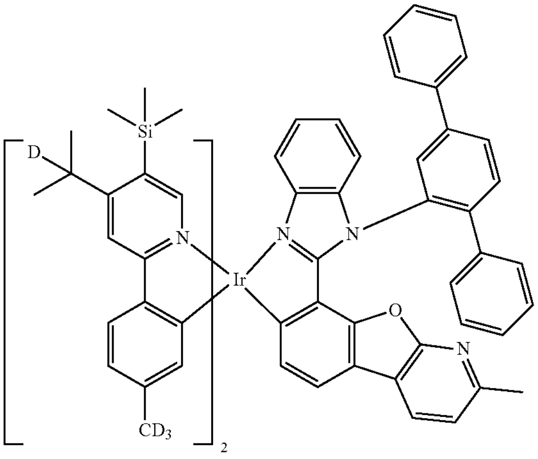
2832
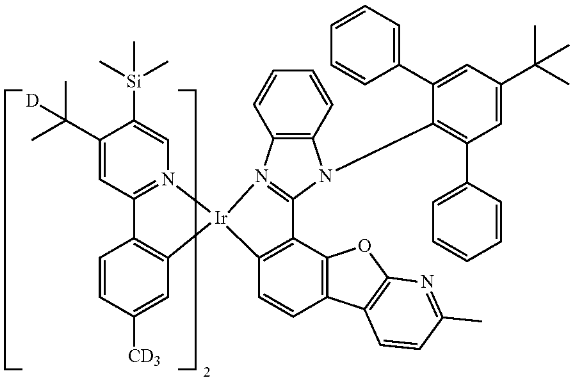
2833
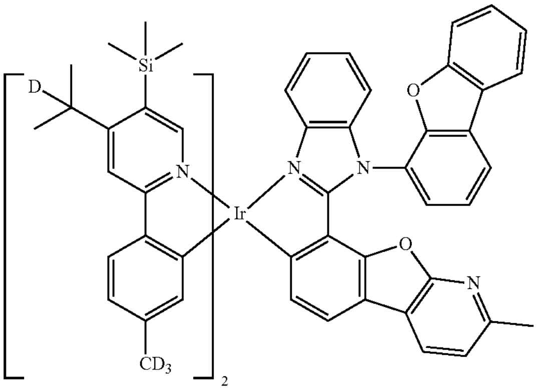

2834
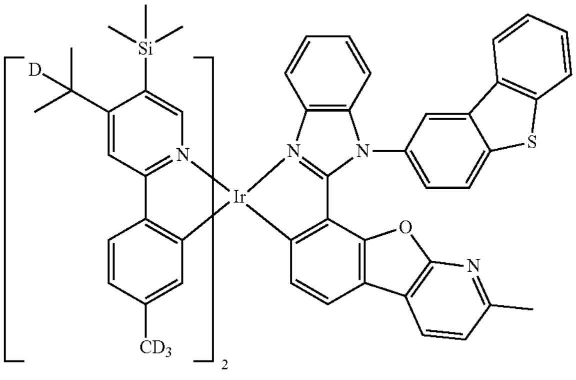
2835
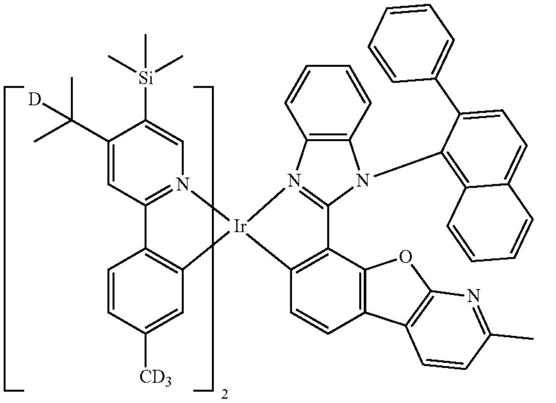
2836
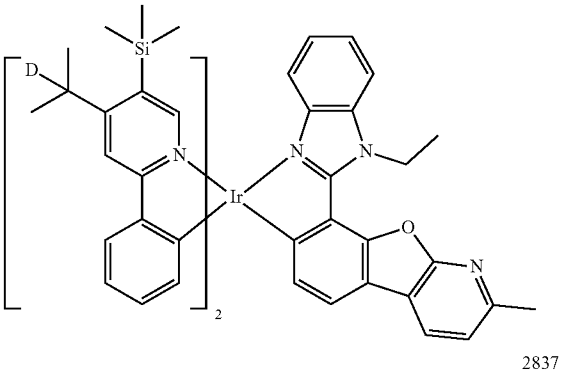
2837
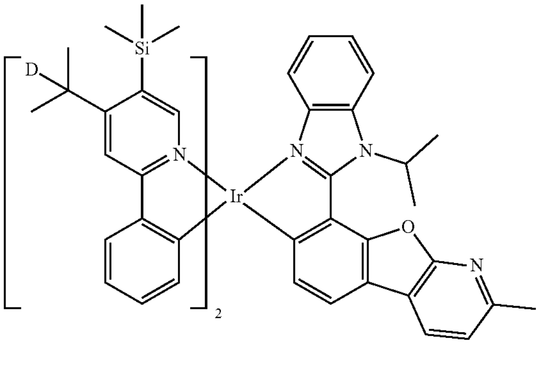
2838
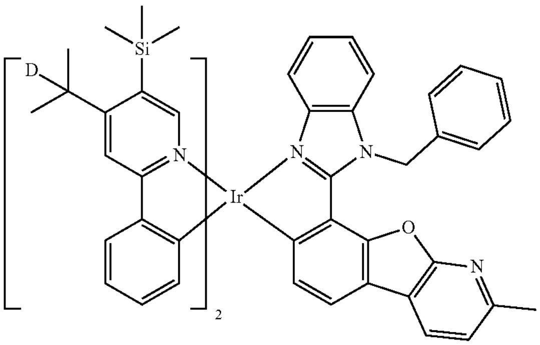
2839
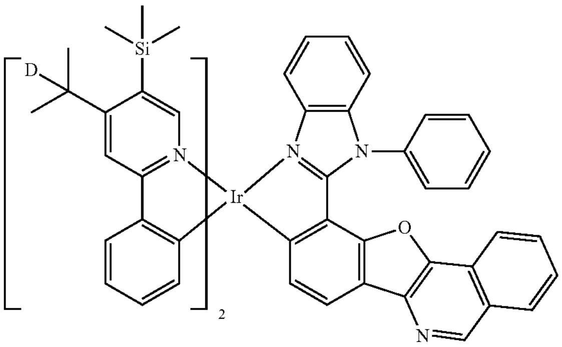
2840
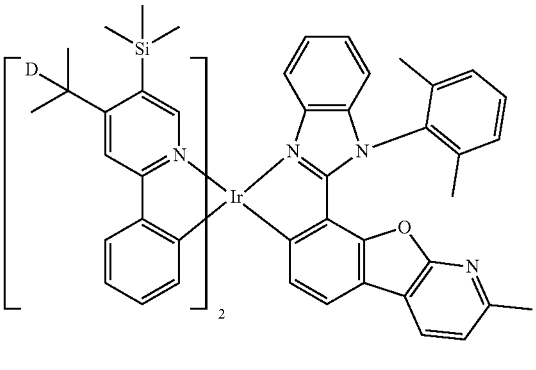
2841
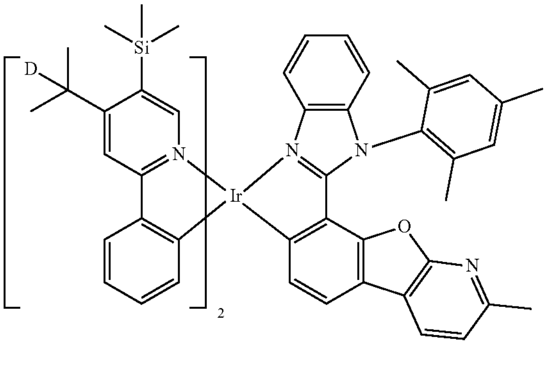

-continued
2842
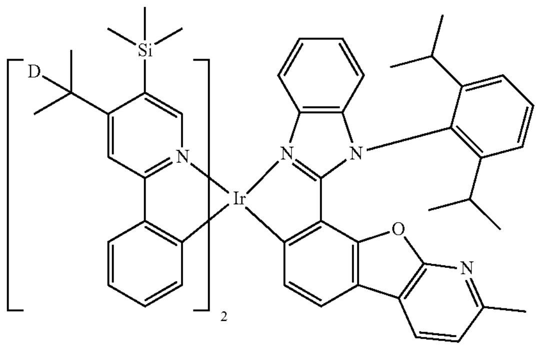
2843
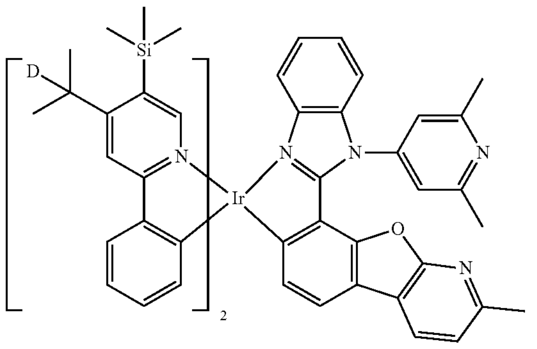
2844
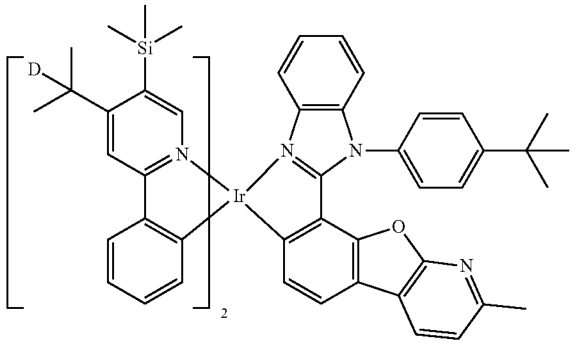
2845
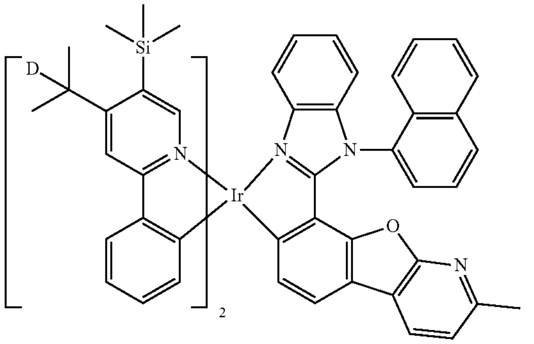
-continued
2846
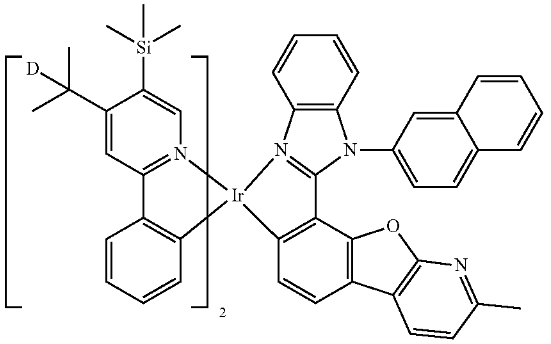
2847
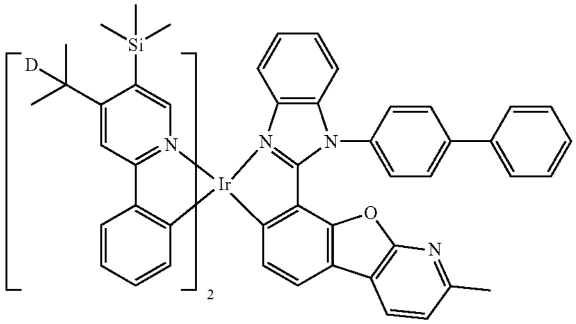
2848
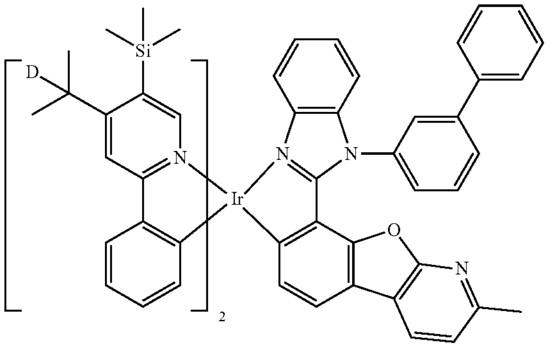
2849
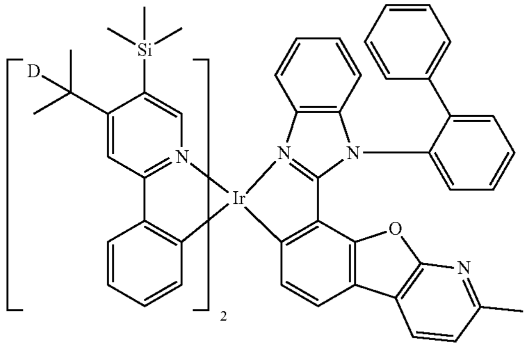

2850
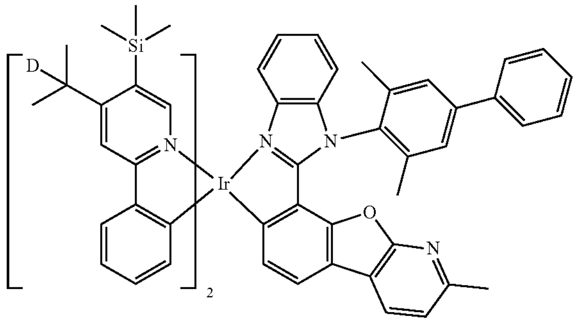
2851
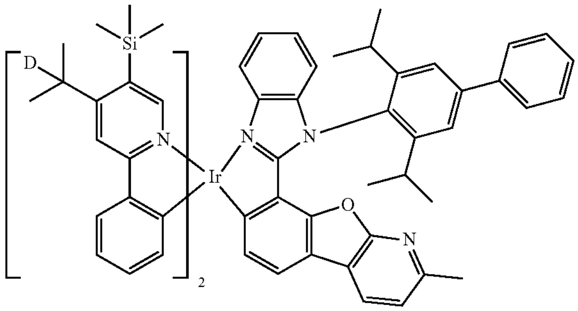
2852
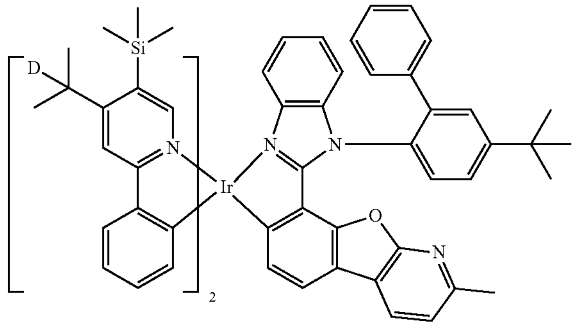
2853
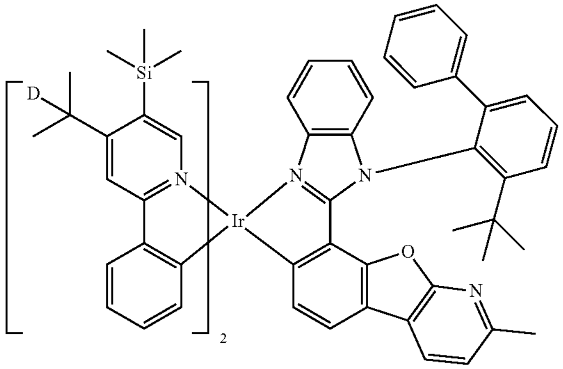
2854
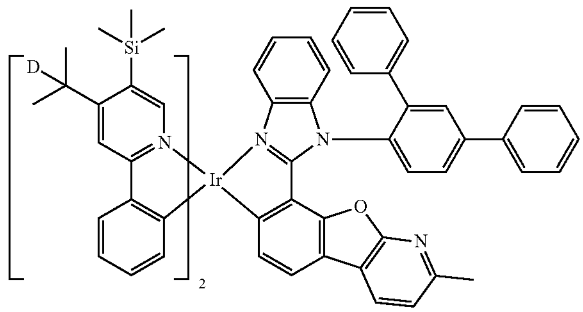
2855
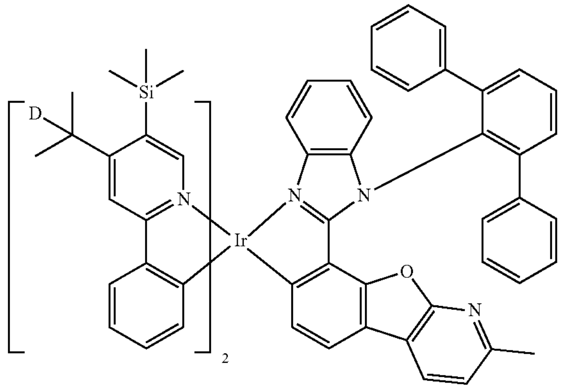
2856
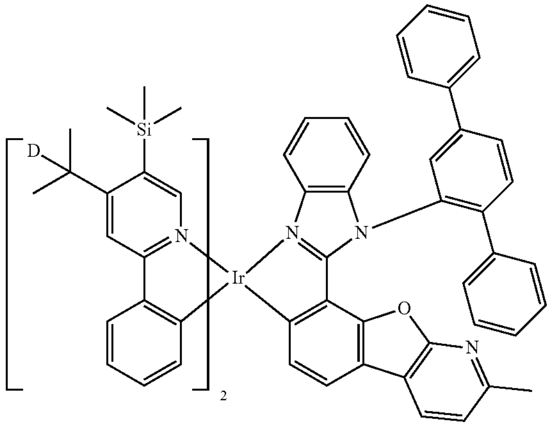
2857
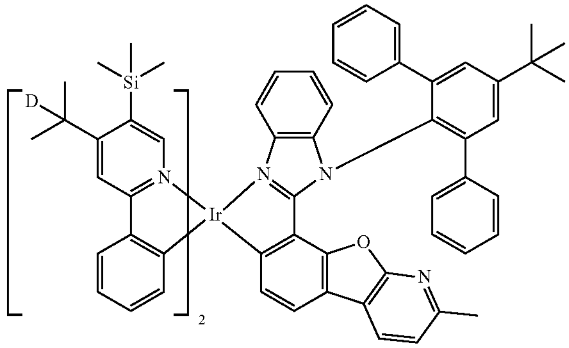

-continued
2858
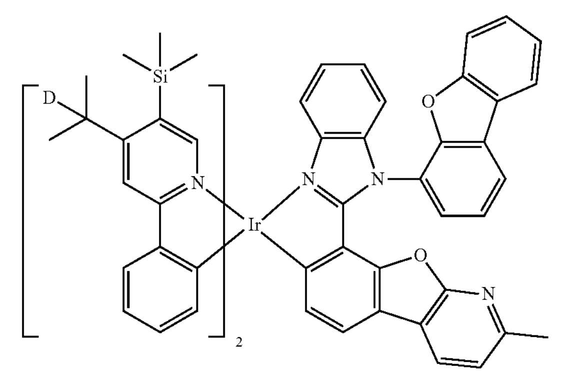
2859
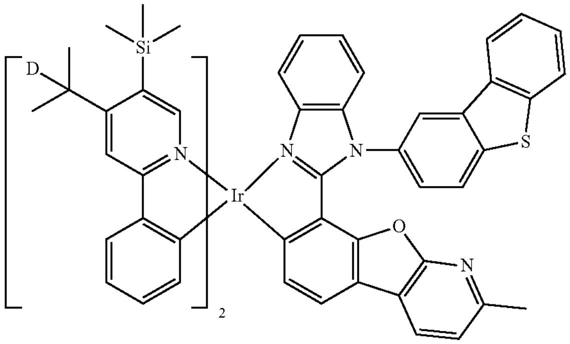
2860
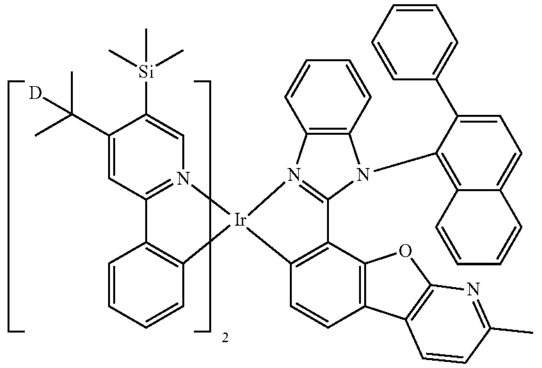
2861
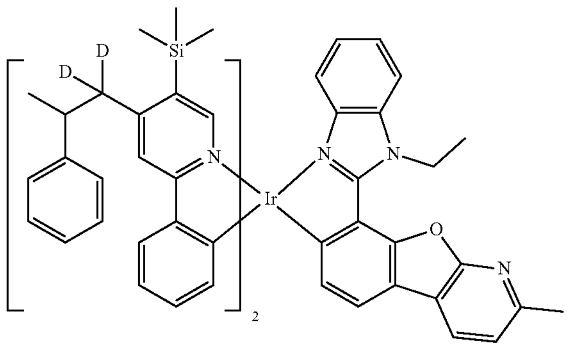
-continued
2862
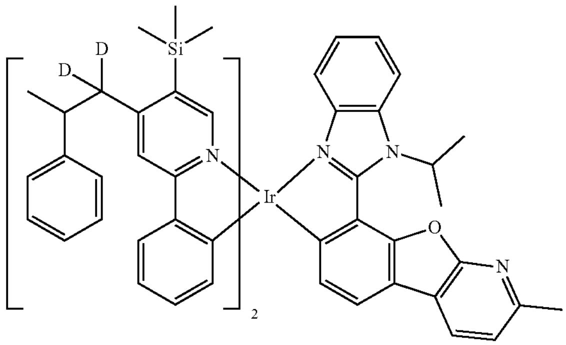
2863
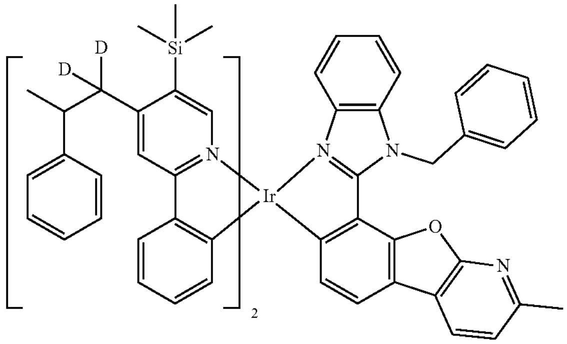
2864
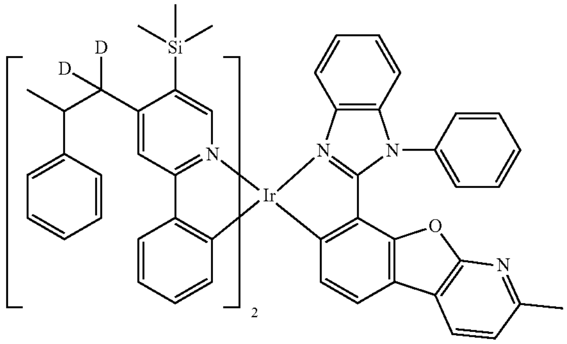
2865
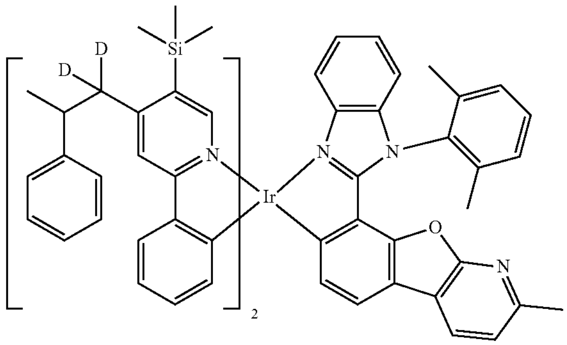

-continued
2866
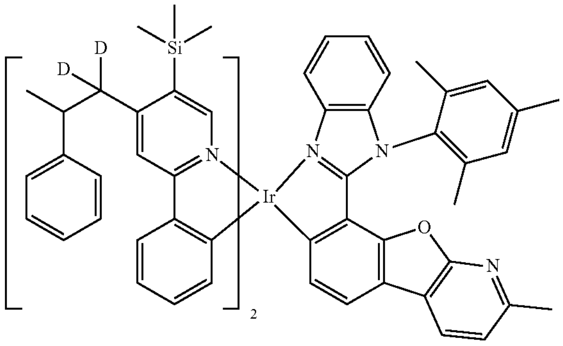
2867
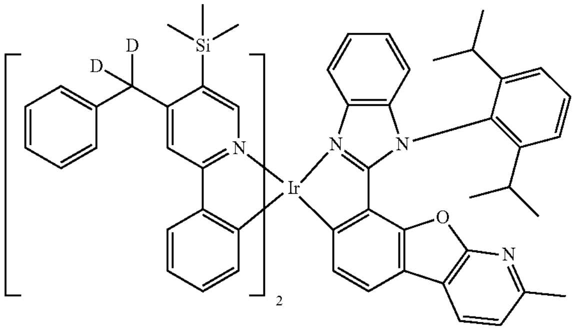
2868
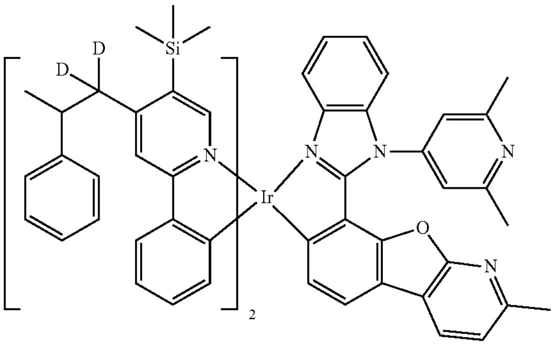
2869
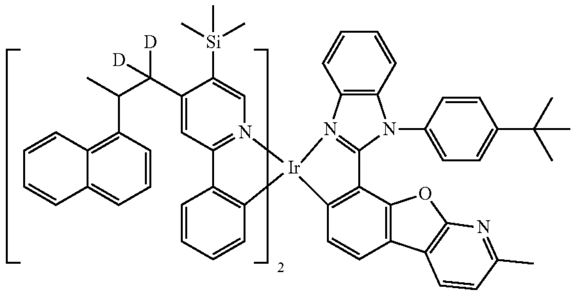
-continued
2870
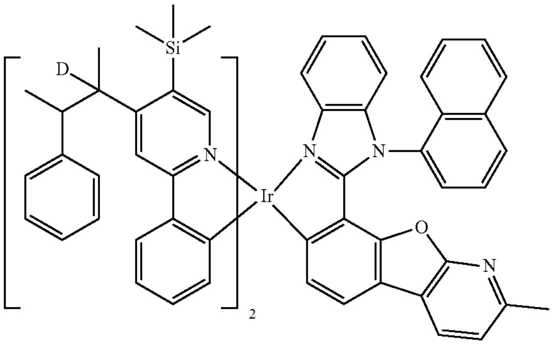
2871
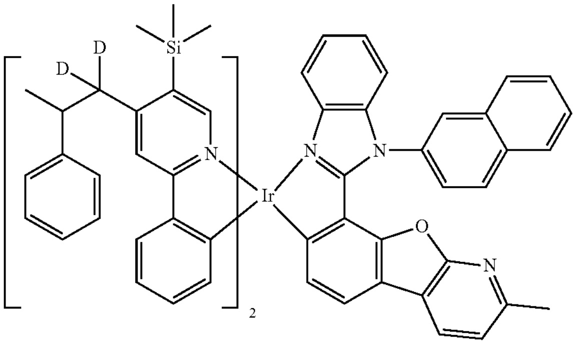
2872
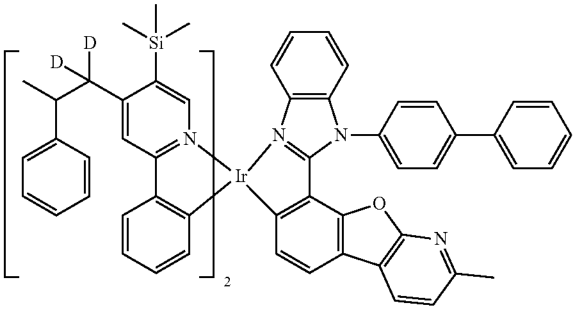
2873
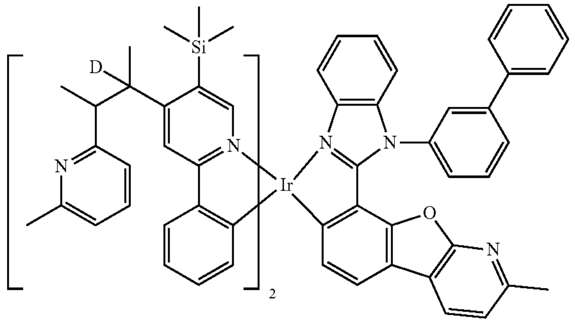

-continued
2874
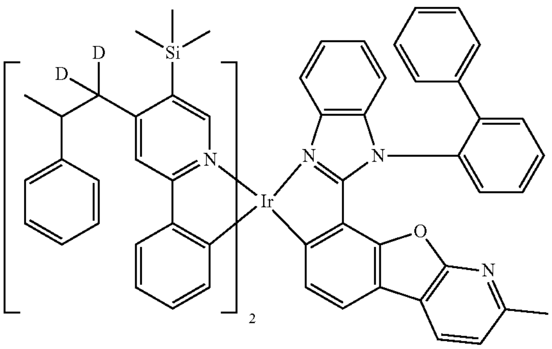
2875
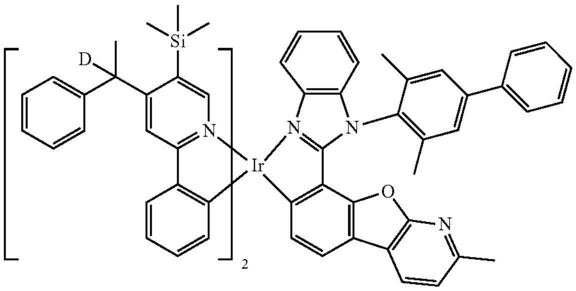
2876
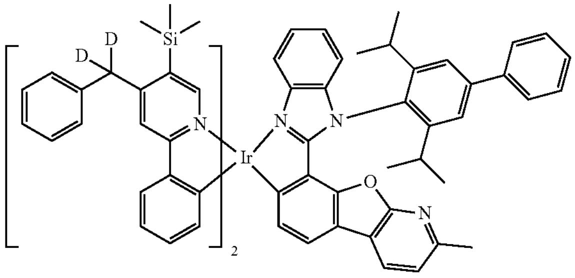
2877
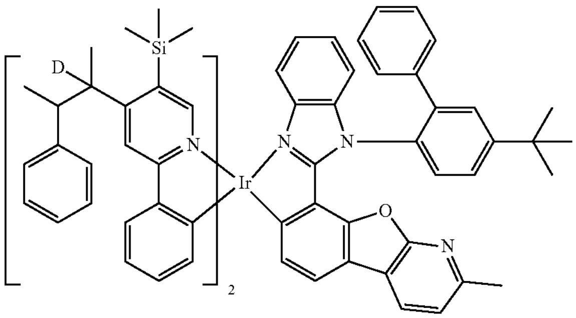
-continued
2878
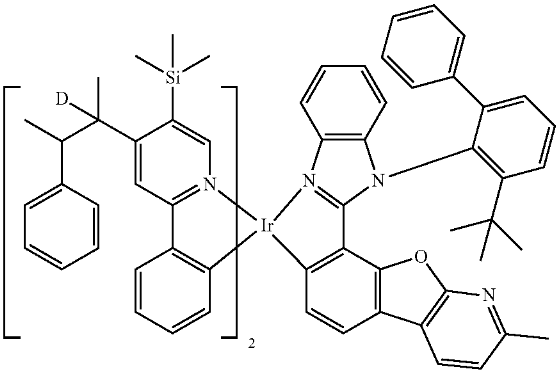
2879
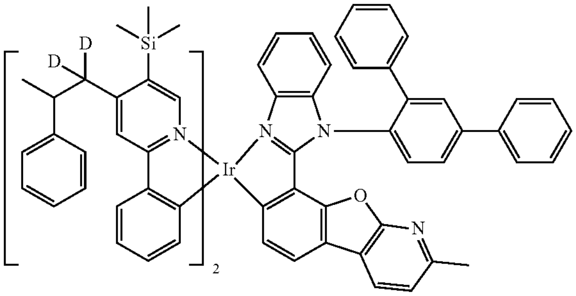
2880
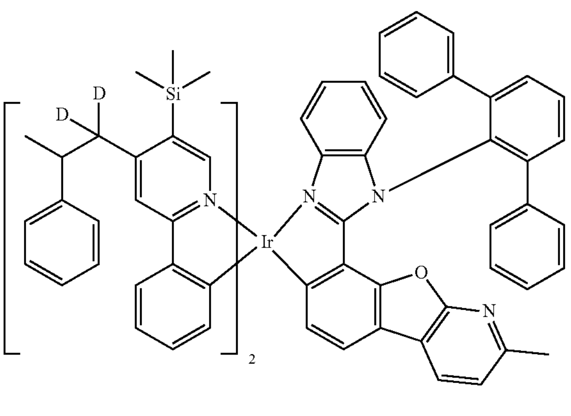
2881
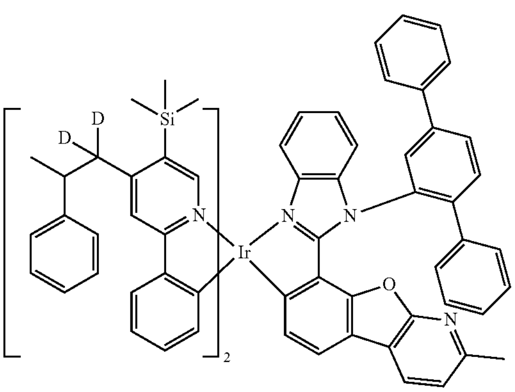

-continued
2882
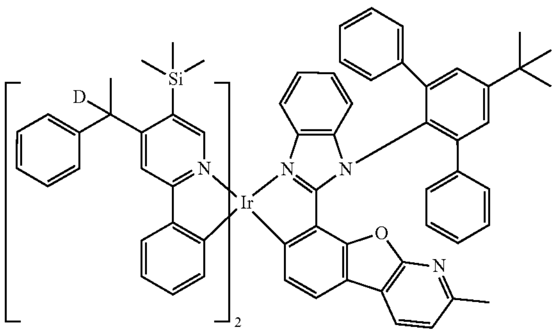
2883
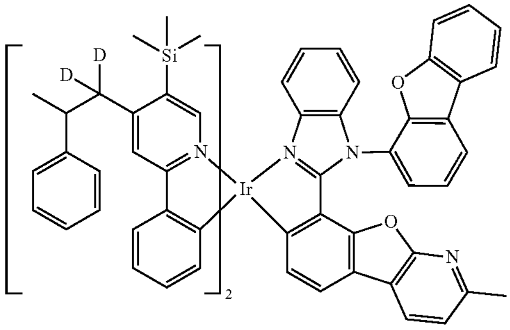
2884
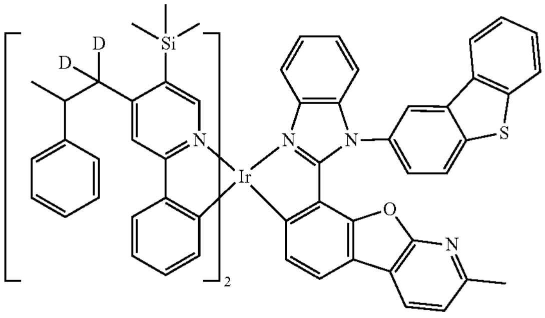
2885
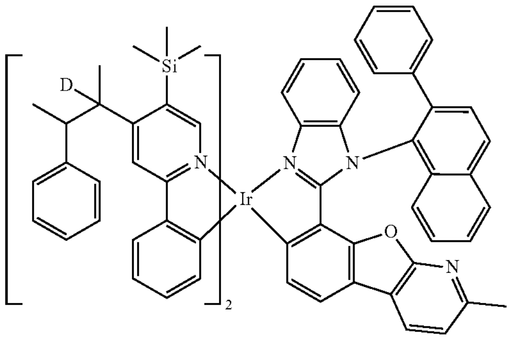
-continued
2886
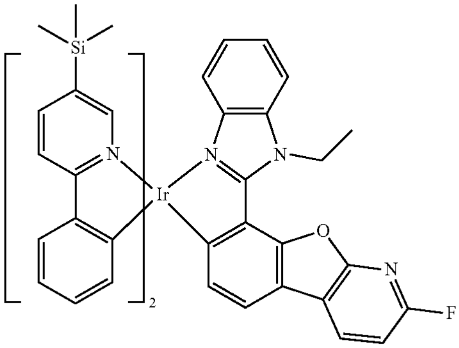
2887
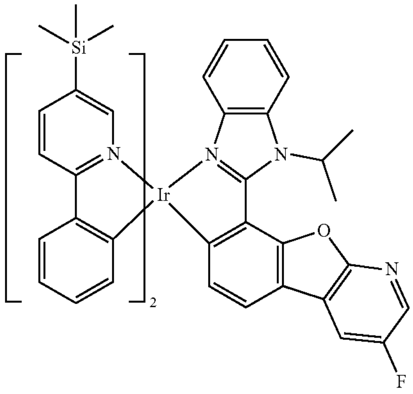
2888
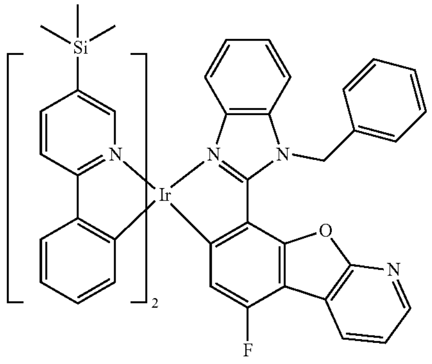
2889
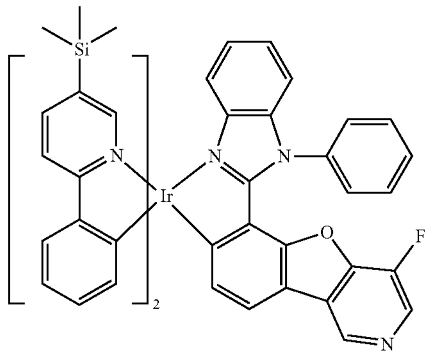

-continued
2890
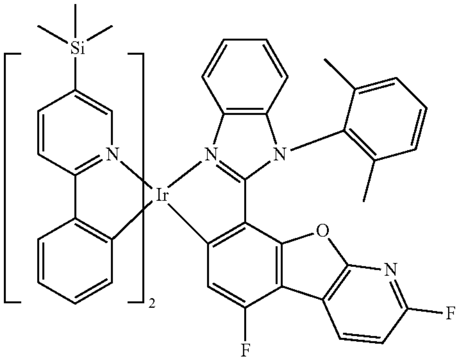
2891
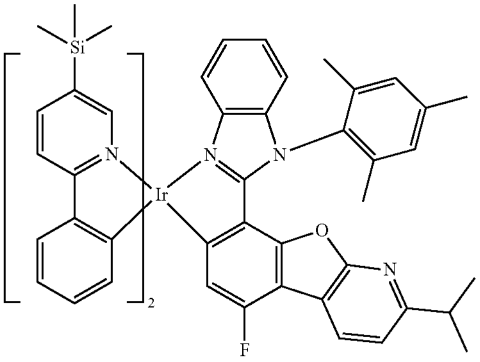
2892
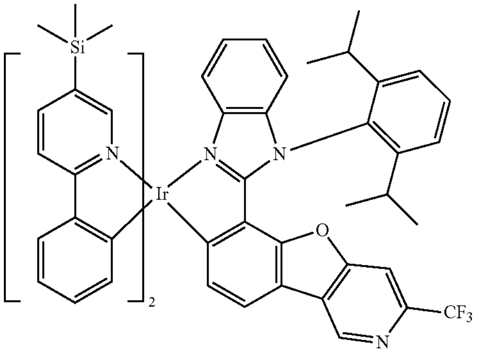
2893
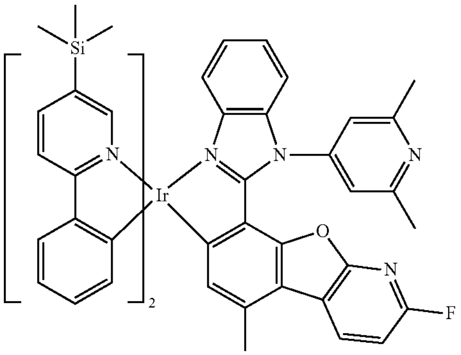
-continued
2894
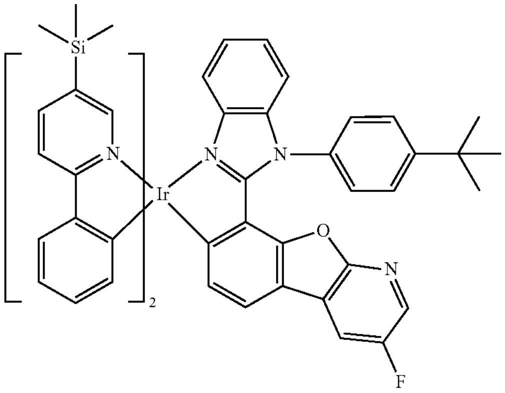
2895
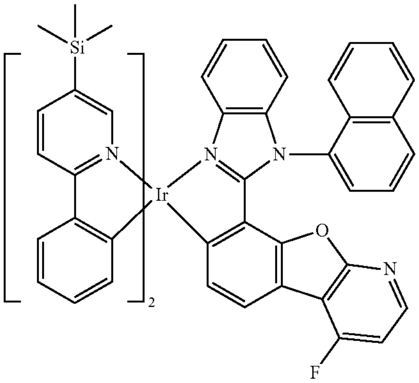
2896
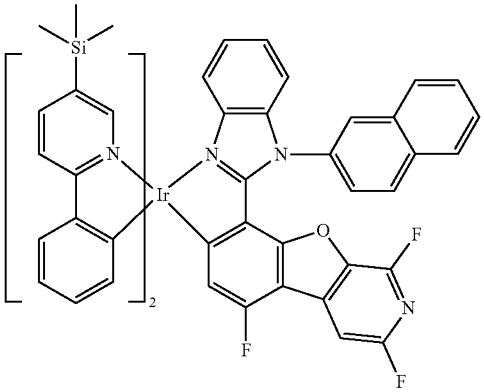

-continued
2897
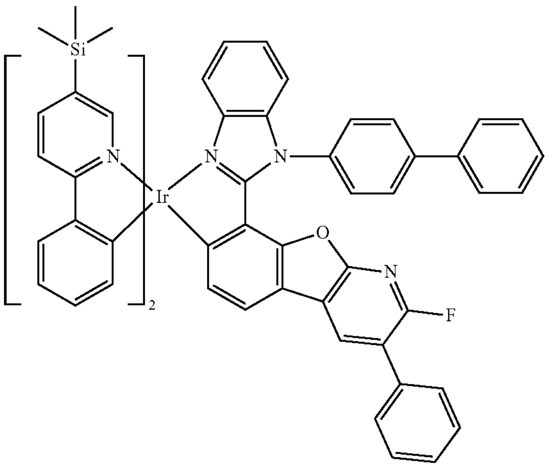
2898
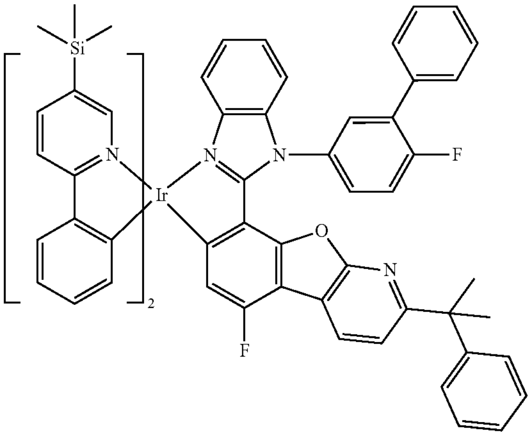
2899
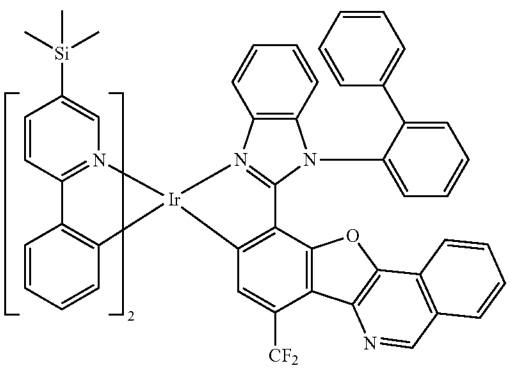
-continued
2900
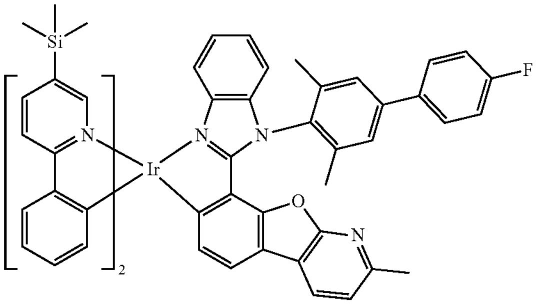
2901
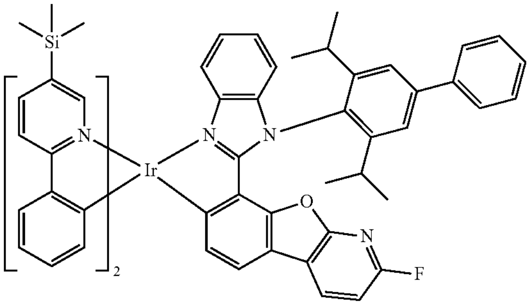
2902
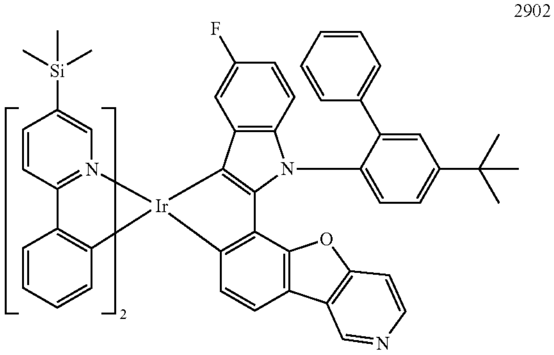
2903
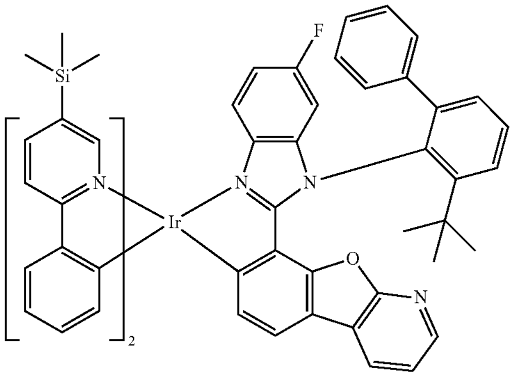

-continued
2904
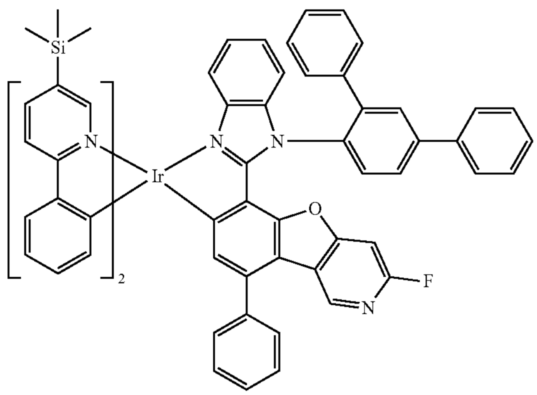
2905
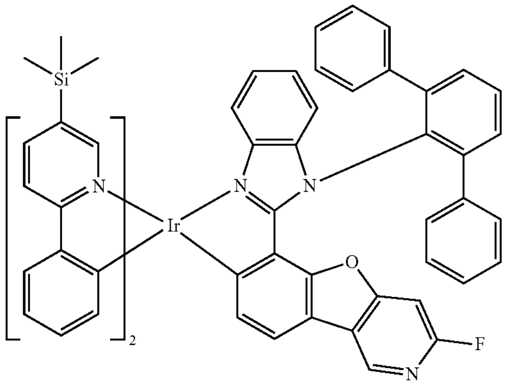
2906
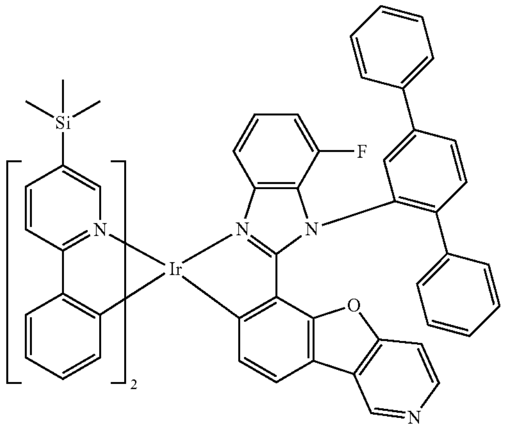
2907
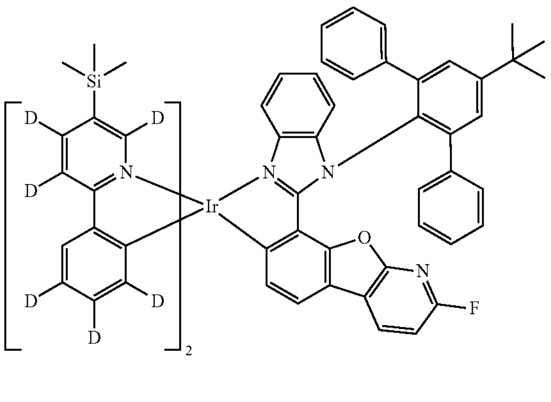
-continued
2908
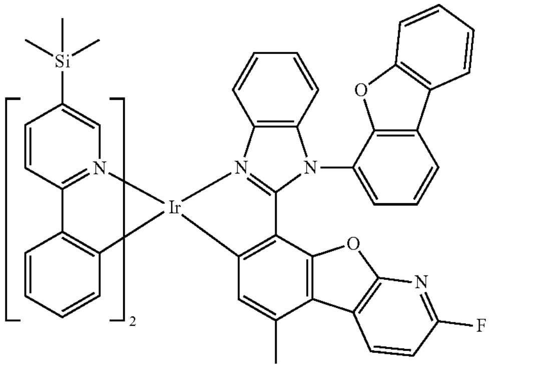
2909
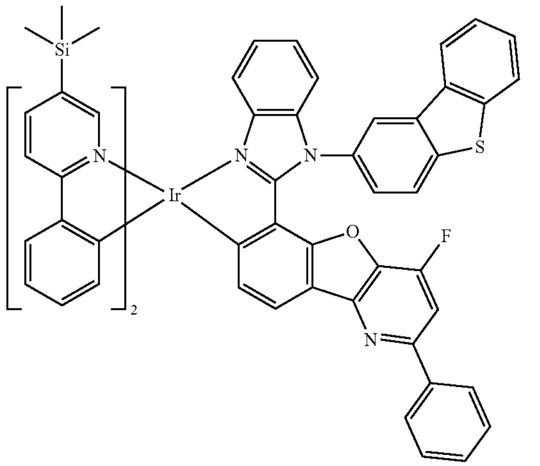
2910
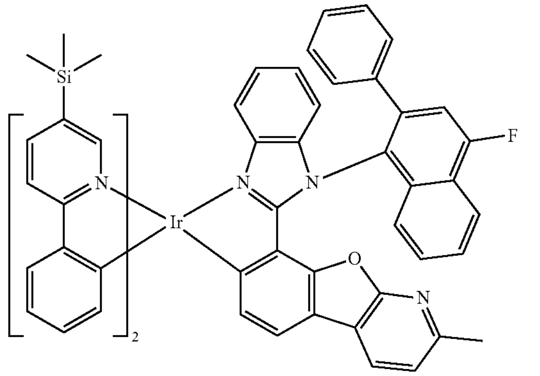
2911
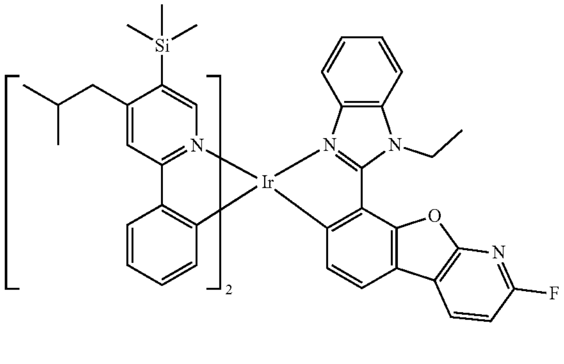

-continued
2912
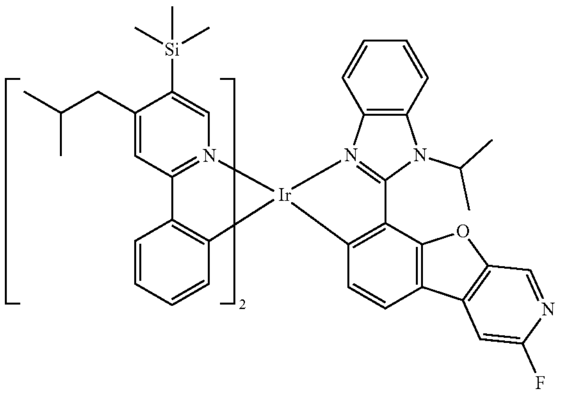
2913
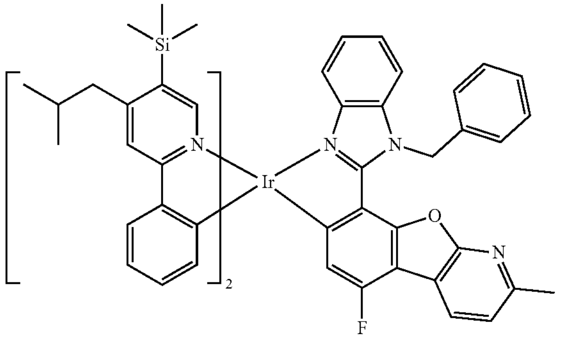
2914
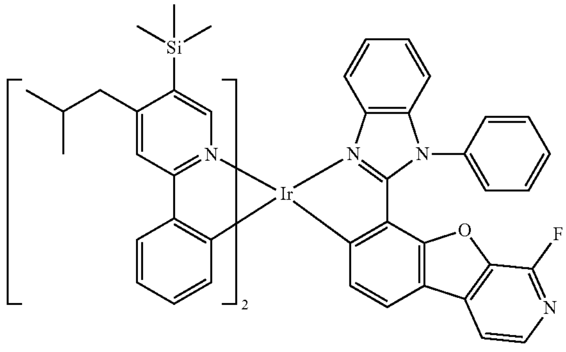
2915
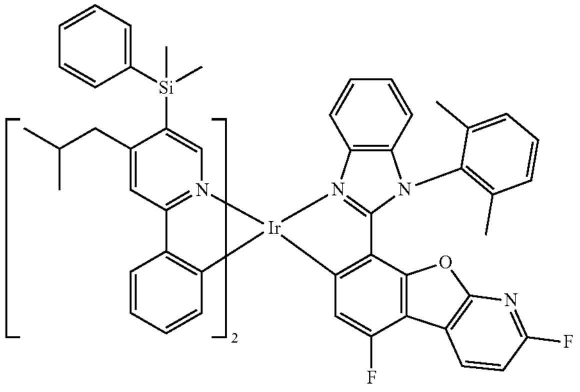
-continued
2916
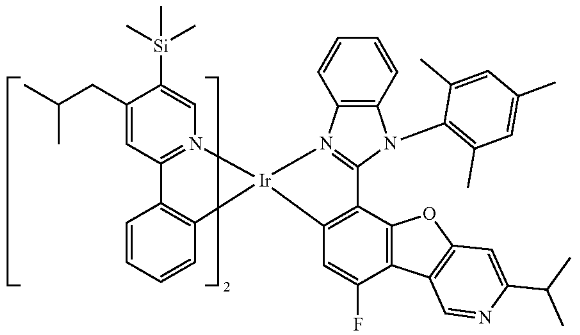
2917
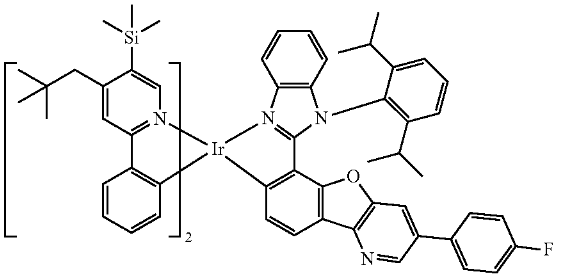
2918
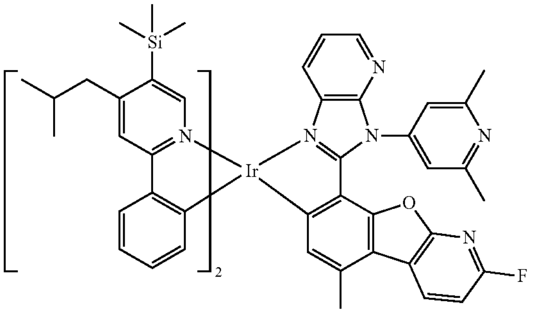
2919
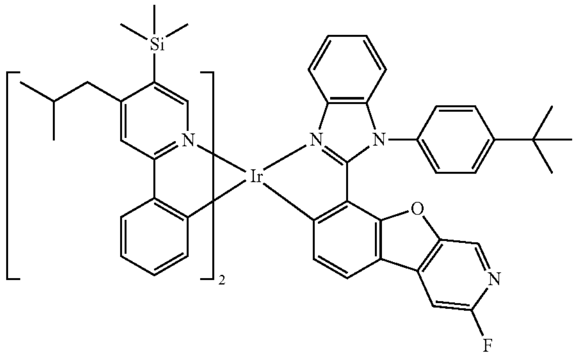

-continued
2920
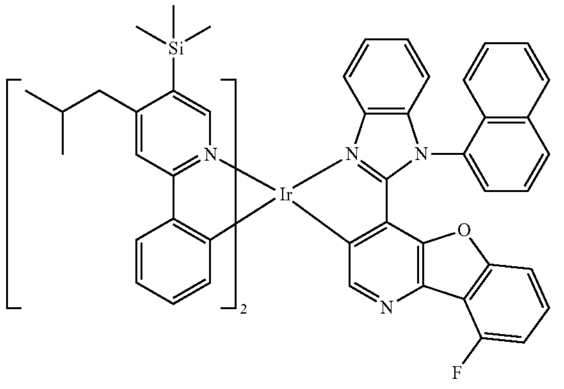
2921
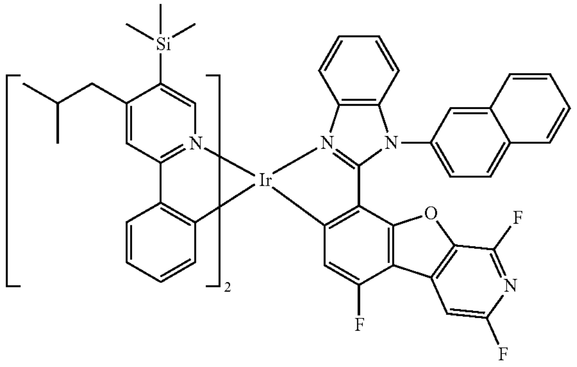
2922
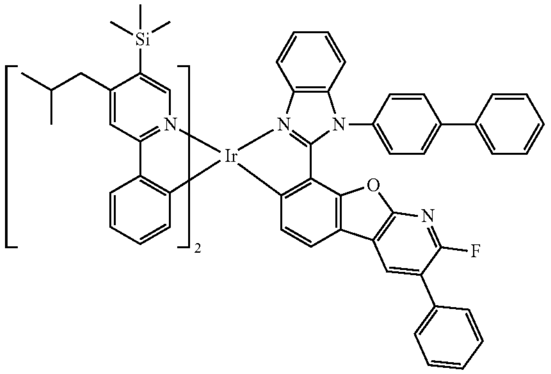
2923
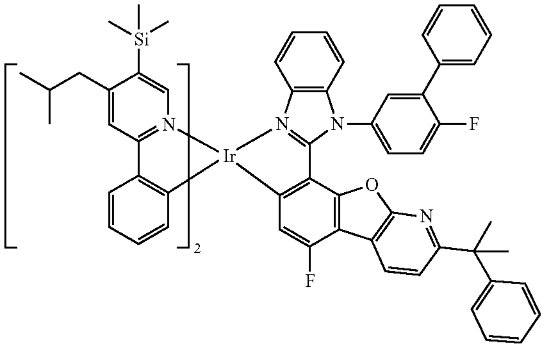
-continued
2924
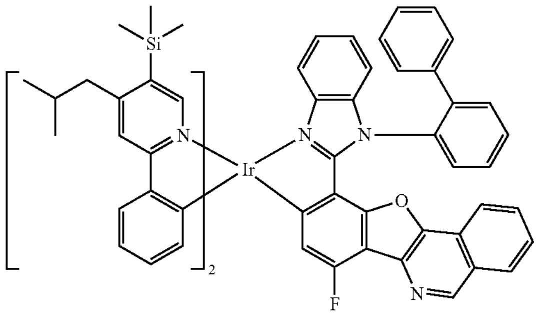
2925
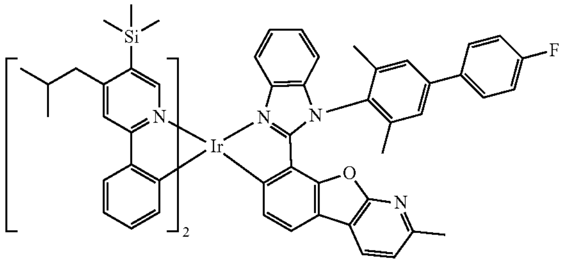
2926
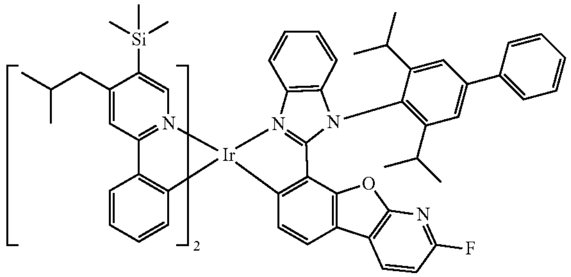
2927
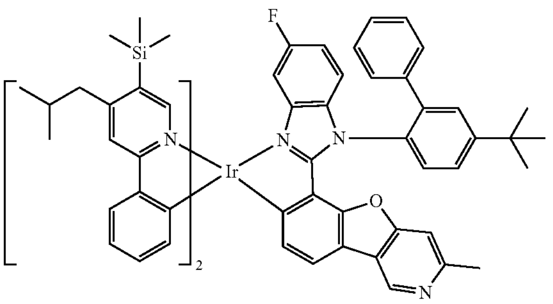

-continued
2928
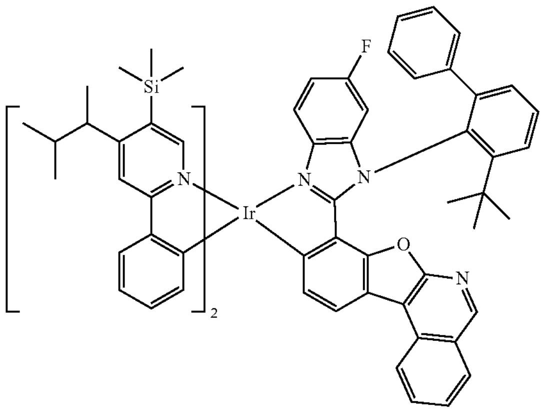
2929
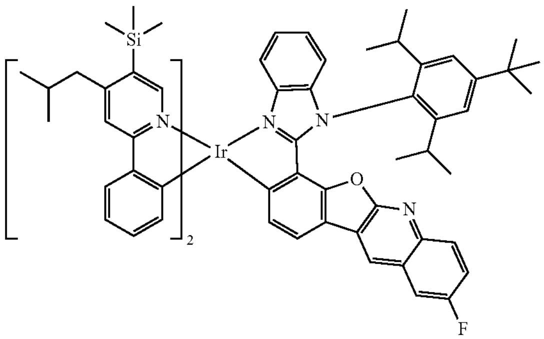
2930
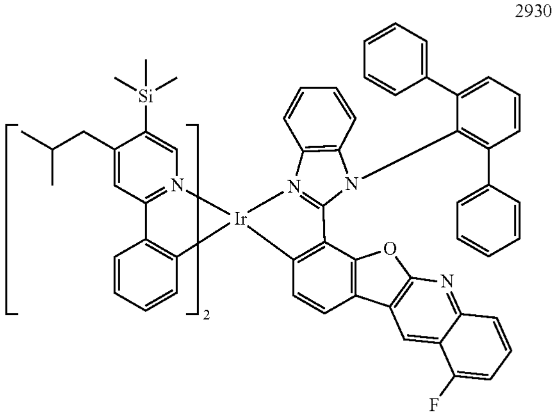
2931
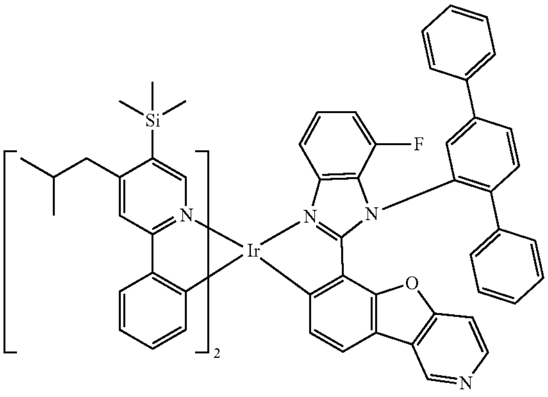
-continued
2932
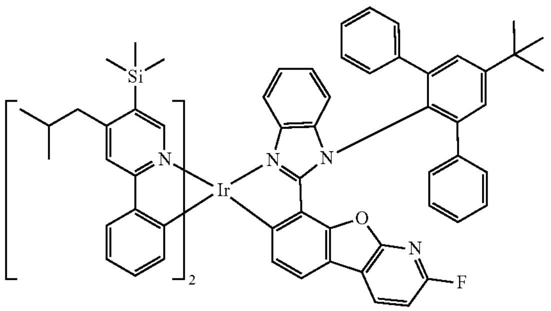
2933
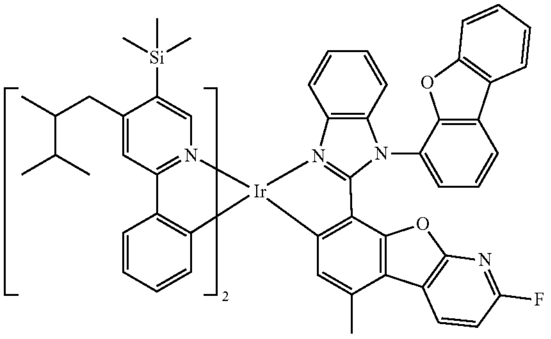
2934
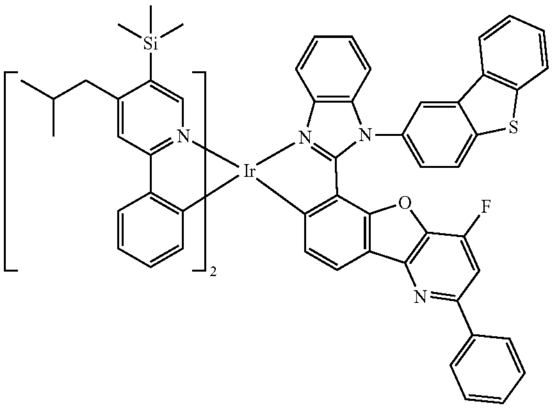
2935
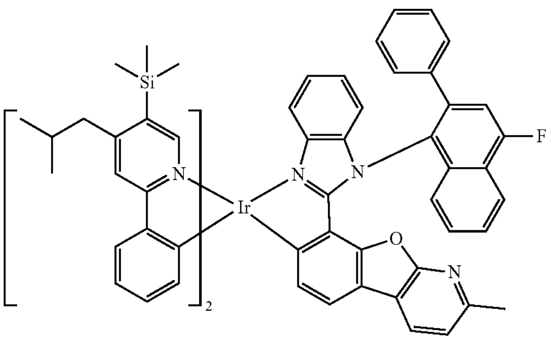

-continued
2936
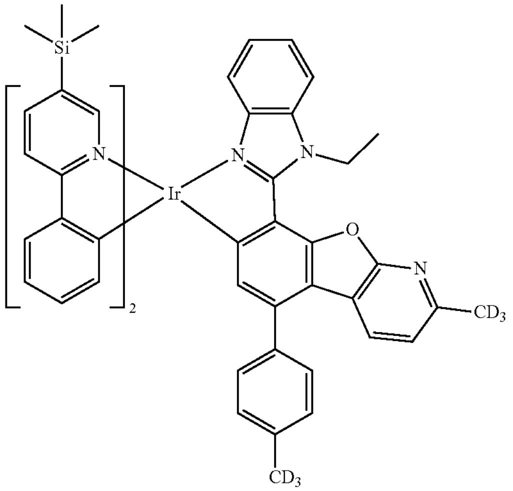
2937
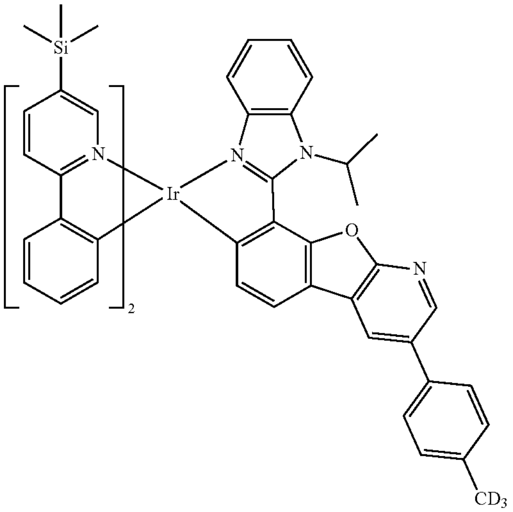
2938
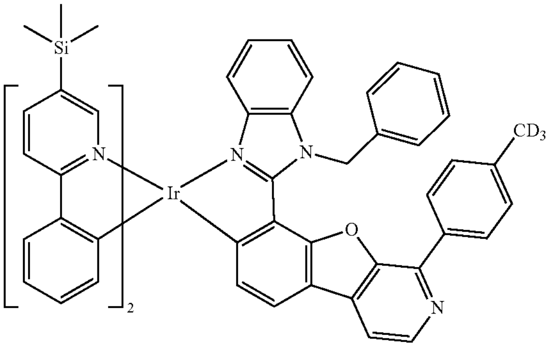
-continued
2939
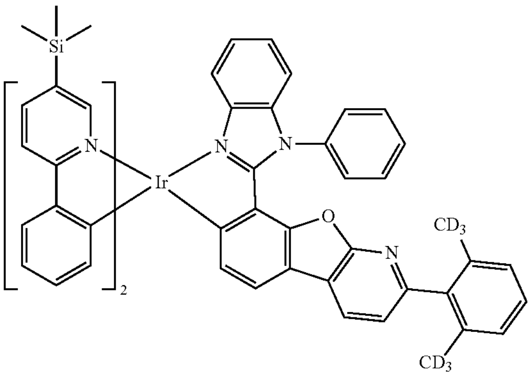
2940
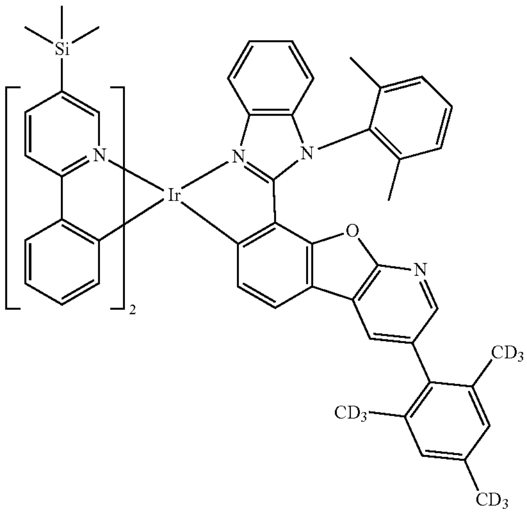
2941
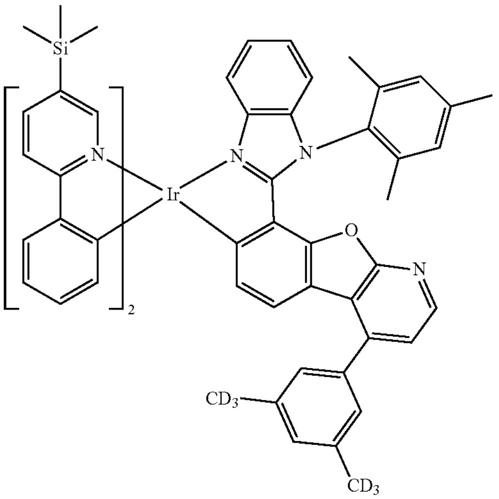

-continued
2942
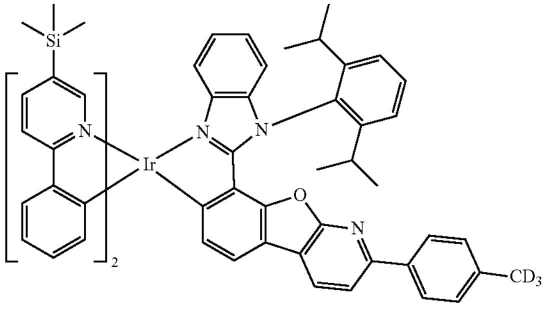
2943
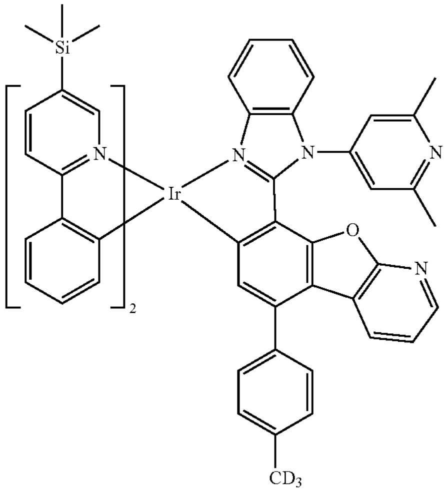
2944
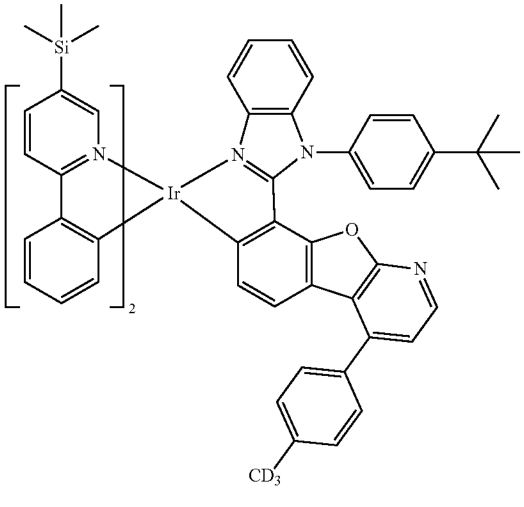
-continued
2945
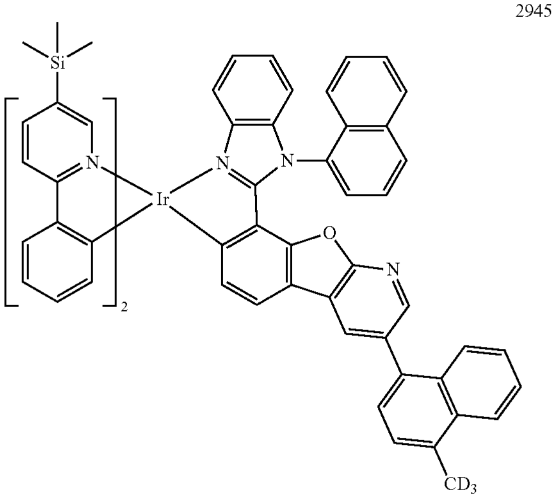
2946
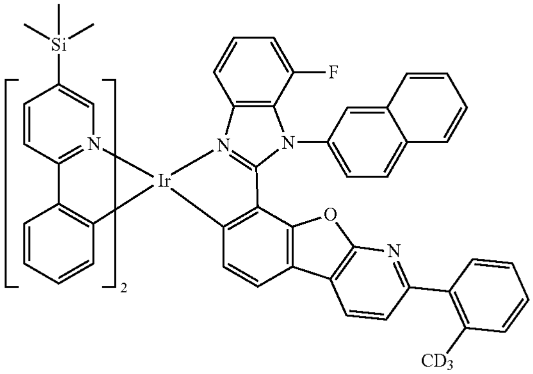
2947
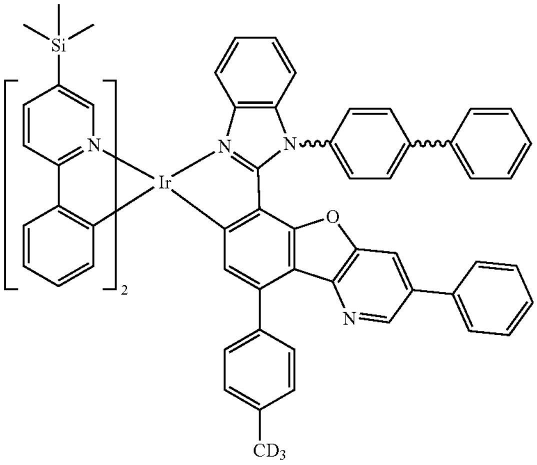

-continued
2948
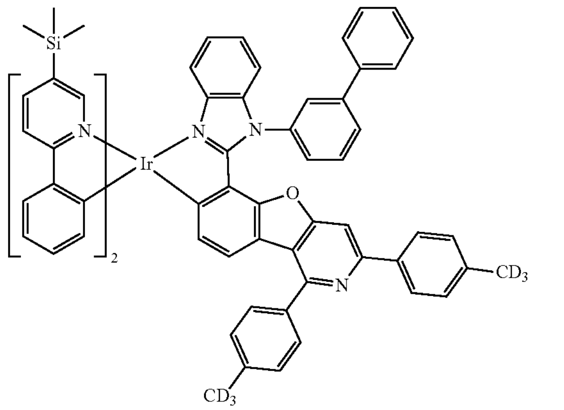
2949
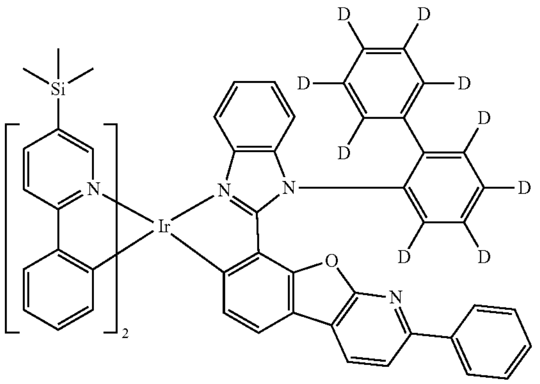
2950
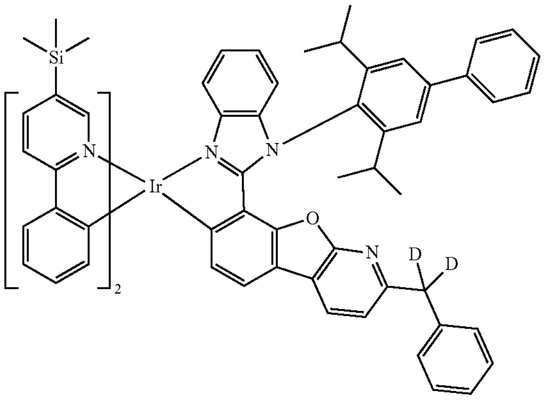
2951
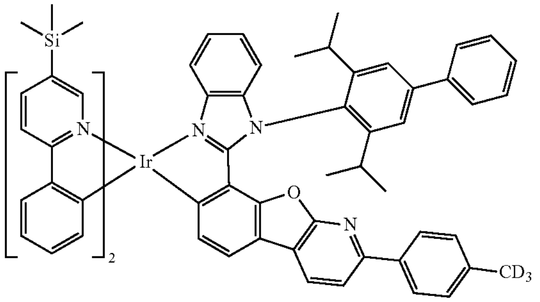
-continued
2952
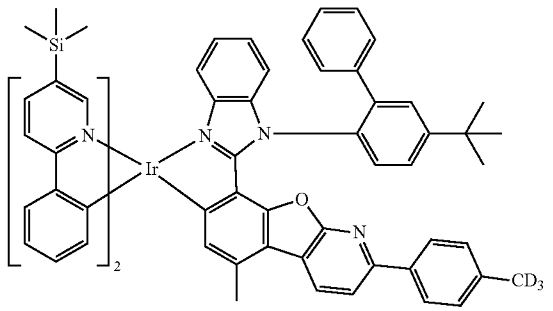
2953
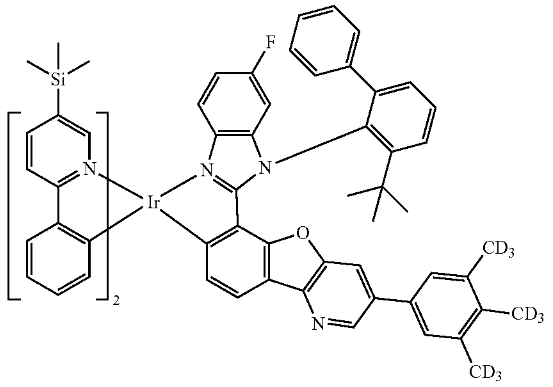
2954
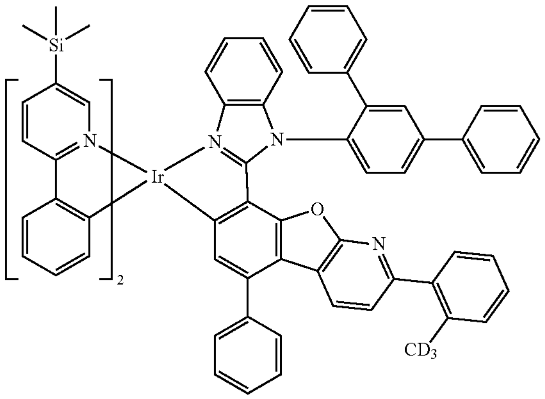
2955
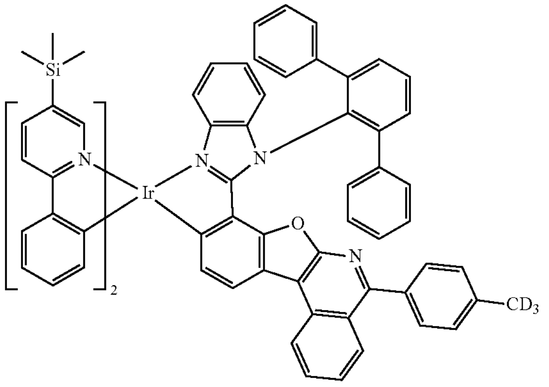

-continued
2956
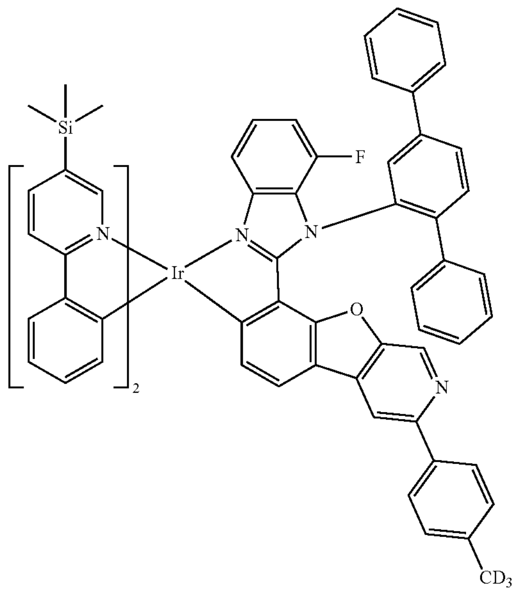
2957
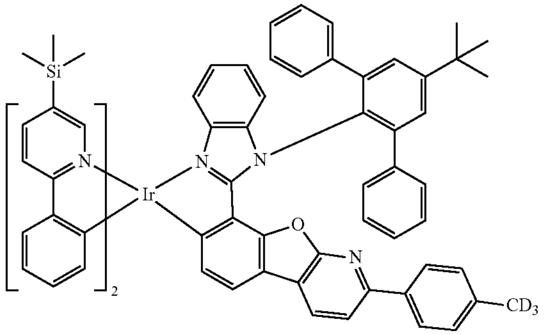
2958
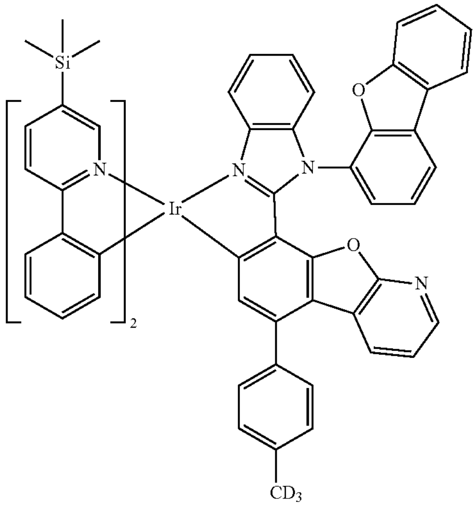
-continued
2959
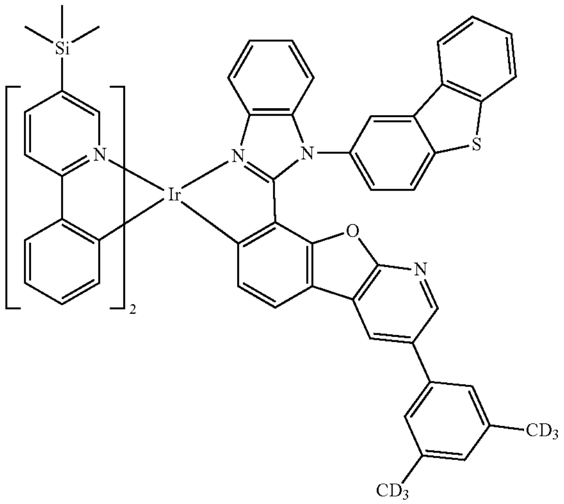
2960
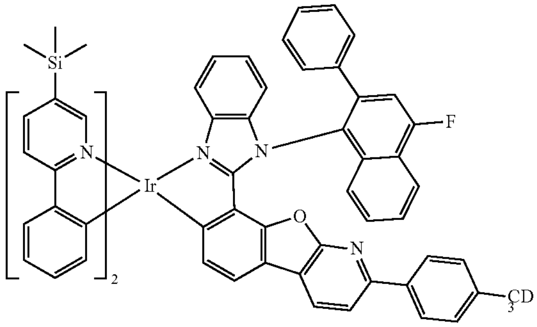
2961
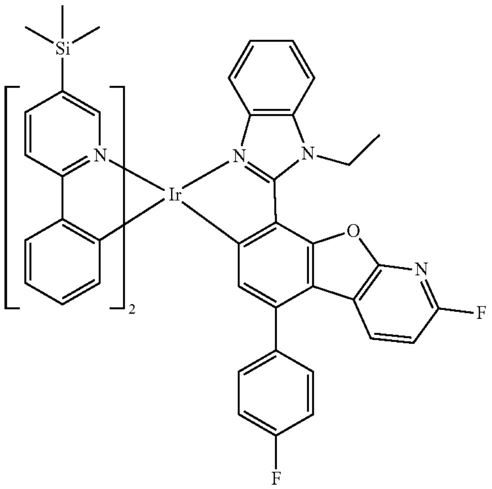

-continued
2962
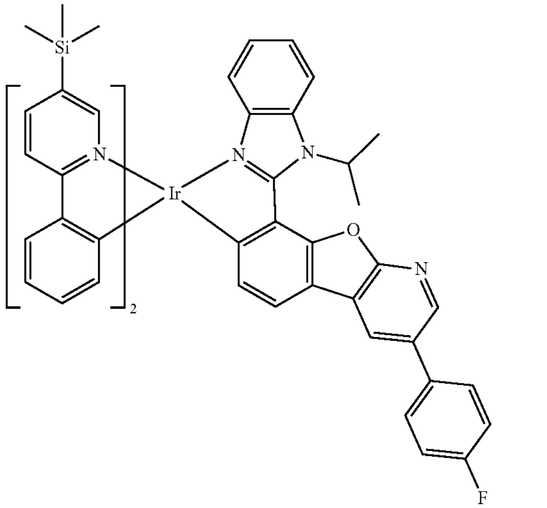
2963
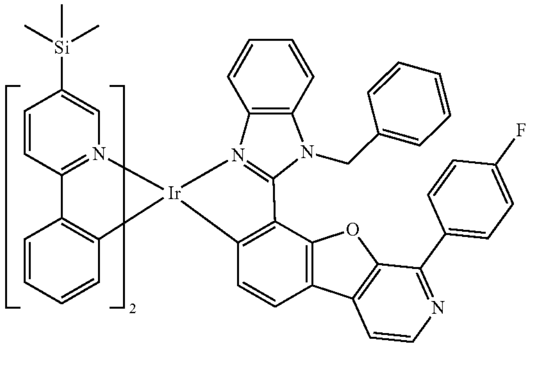
2964
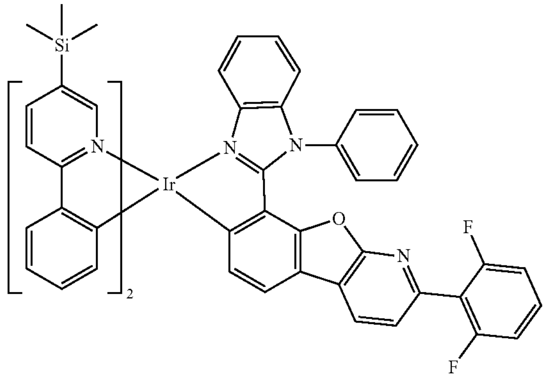
-continued
2965
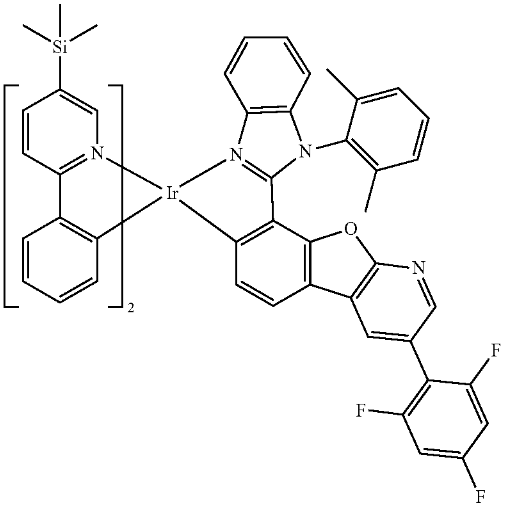
2966
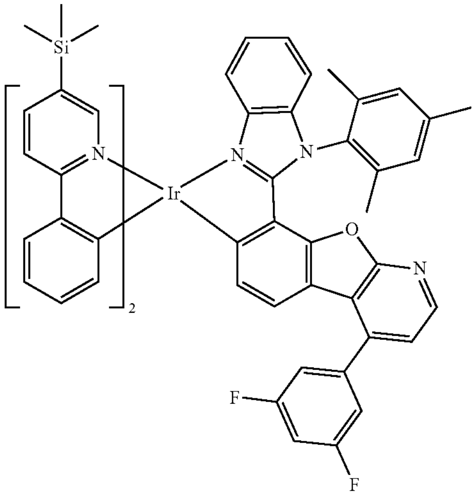
2967
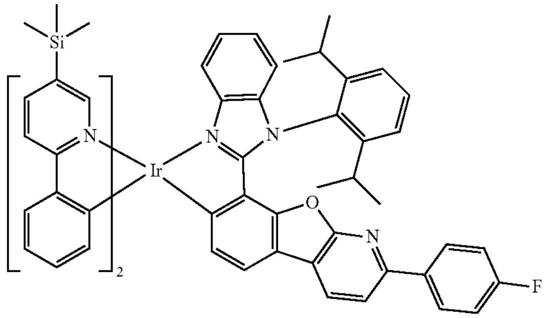

-continued
2968
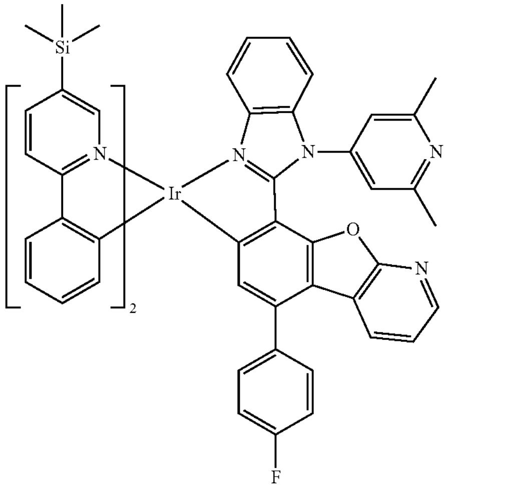
2969
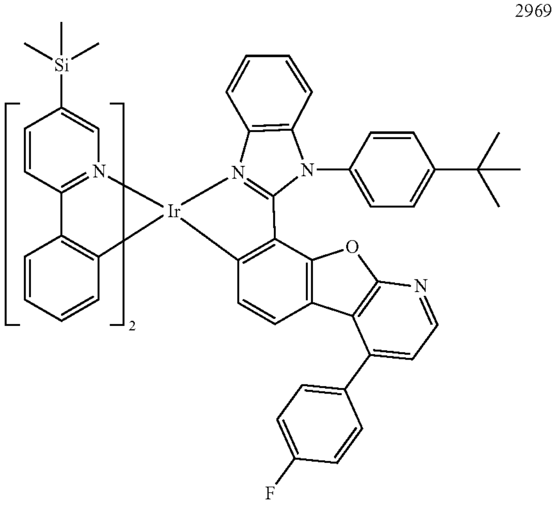
2970
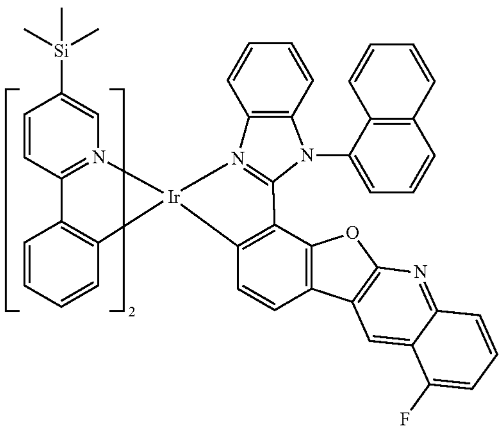
-continued
2971
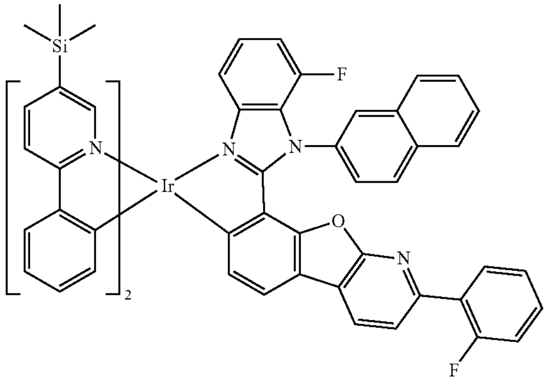
2972
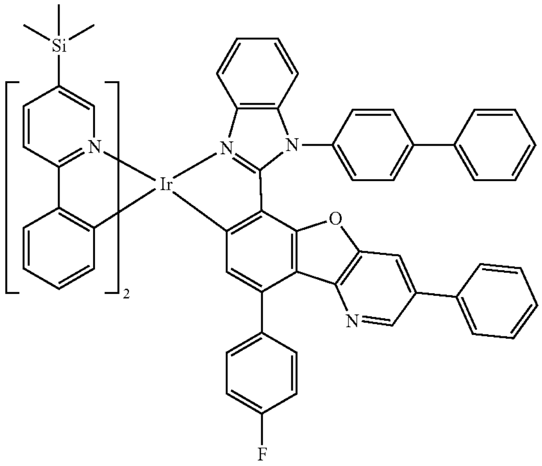
2973
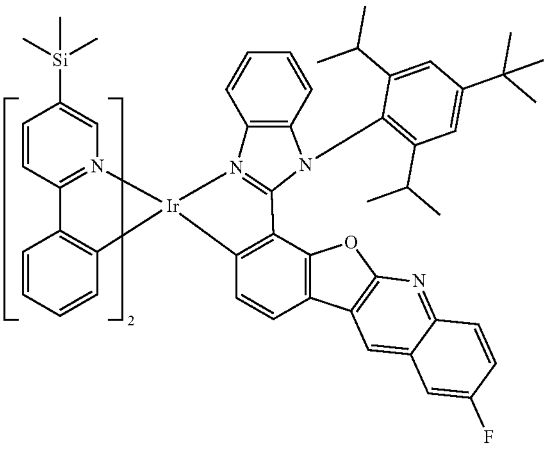

-continued
2974
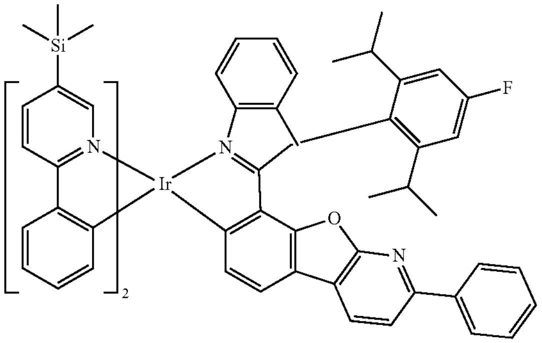
2975
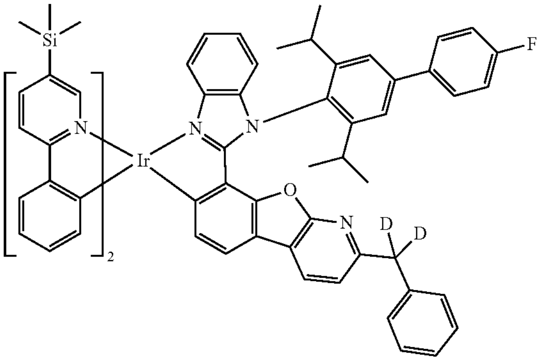
2976
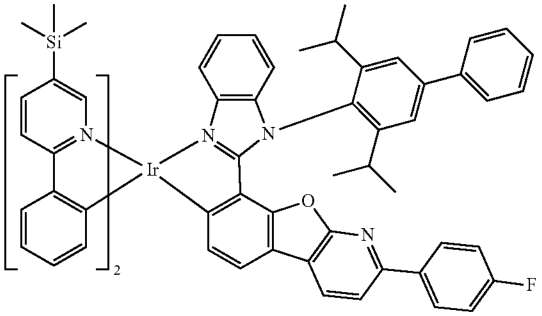
2977
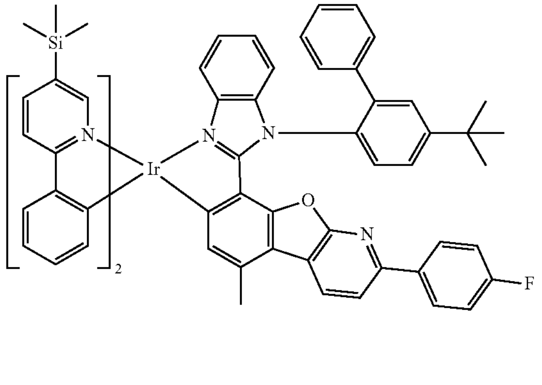
-continued
2978
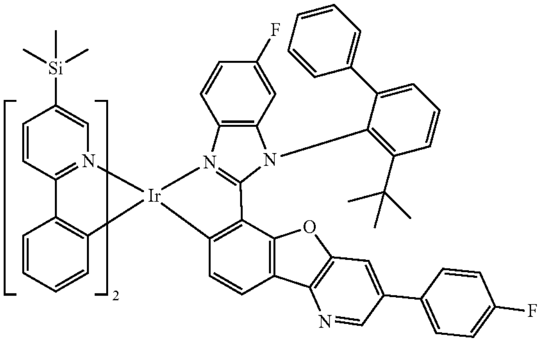
2979
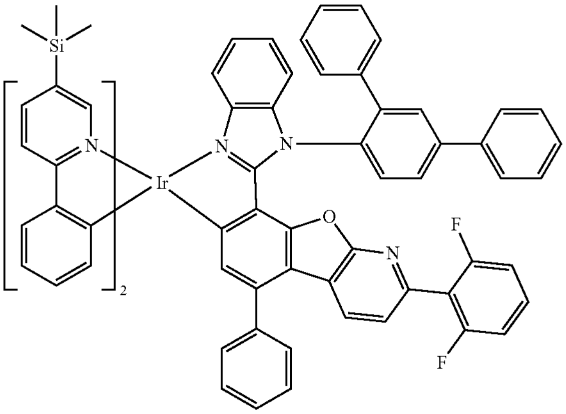
2980
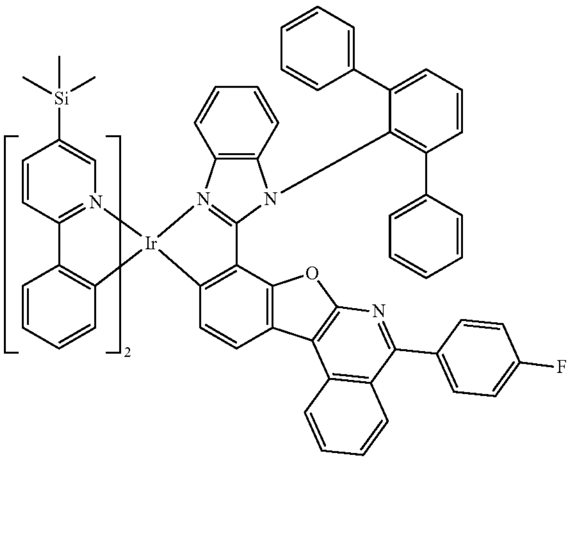

-continued
2981
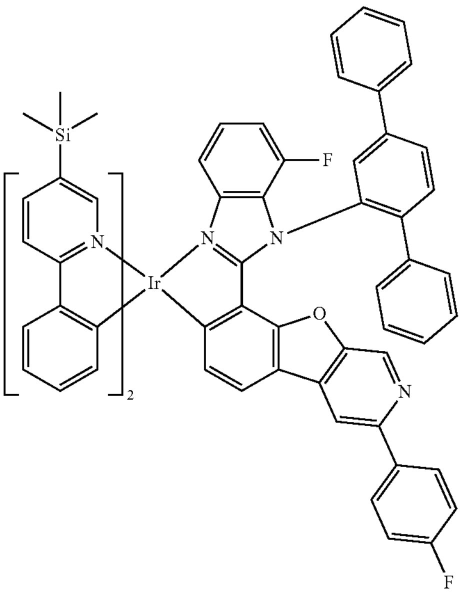
2982
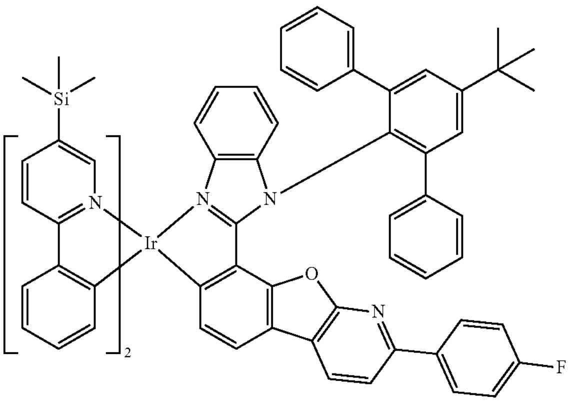
2983
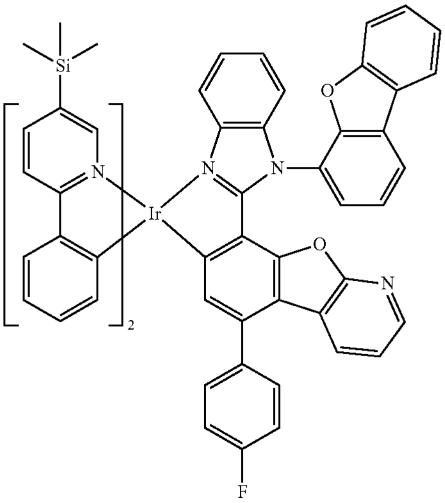
-continued
2984
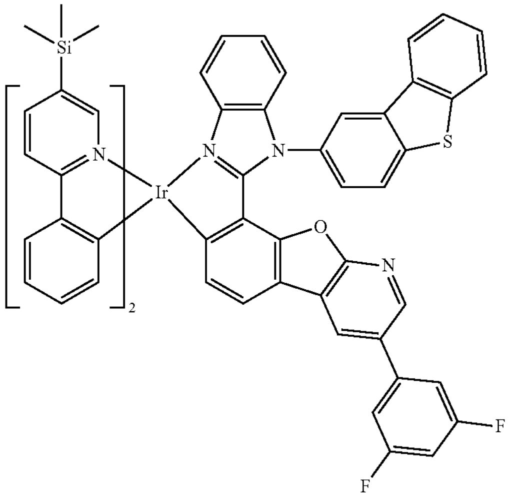
2985
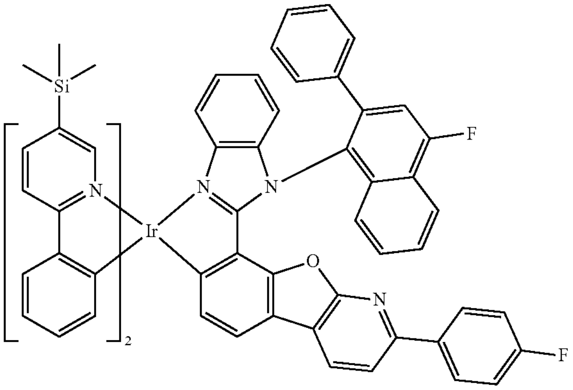
2986
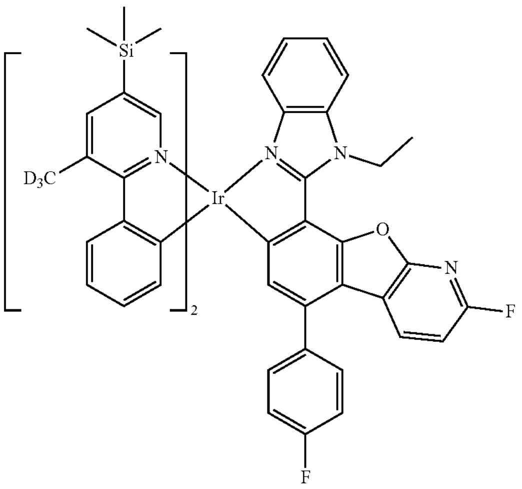

-continued
2987
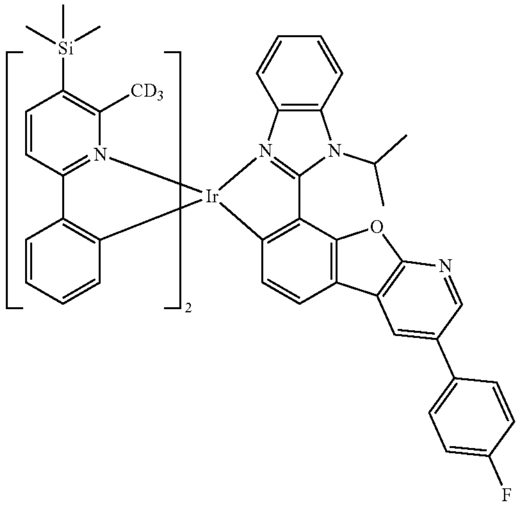
2988
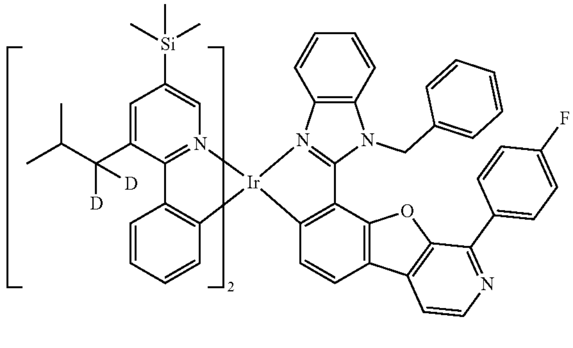
2989
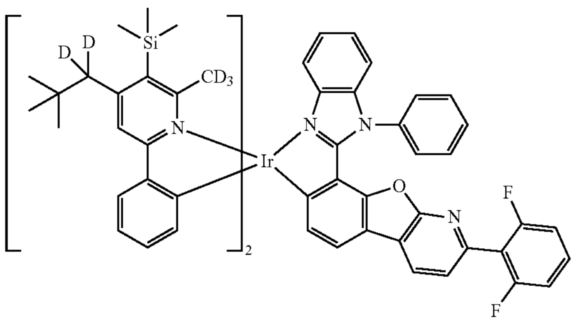
-continued
2990
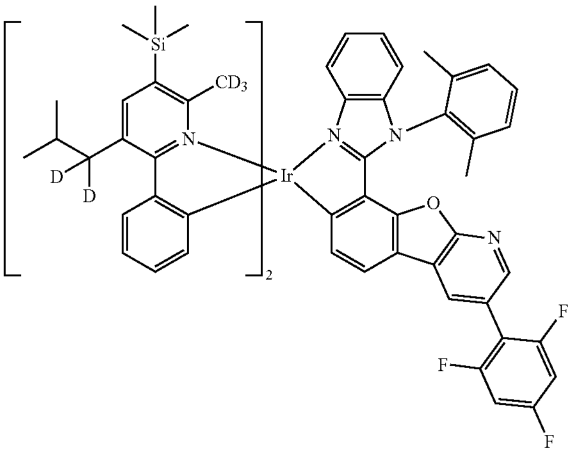
2991
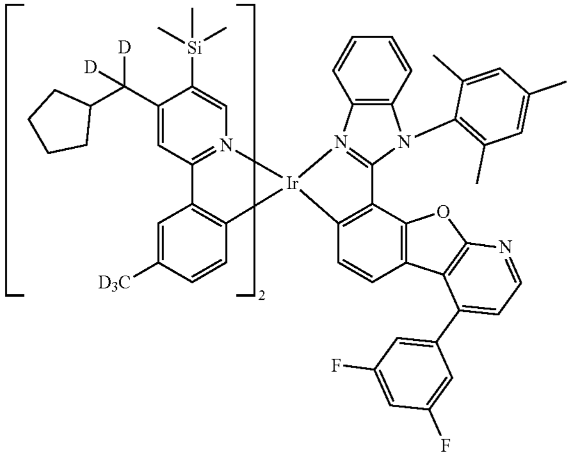
2992
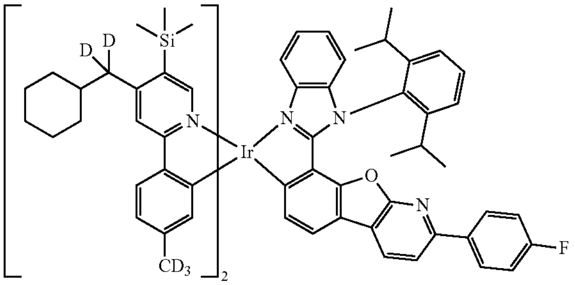

-continued
2993
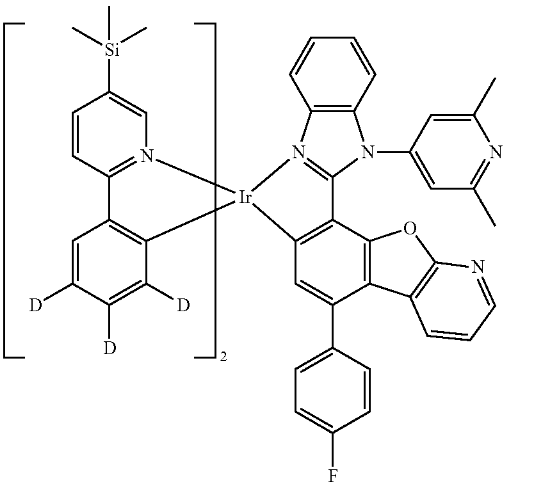
2994
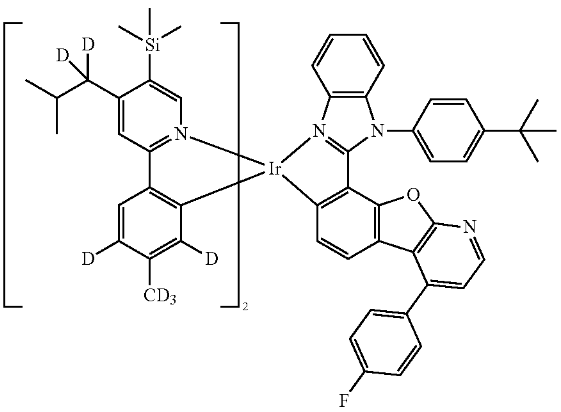
2995
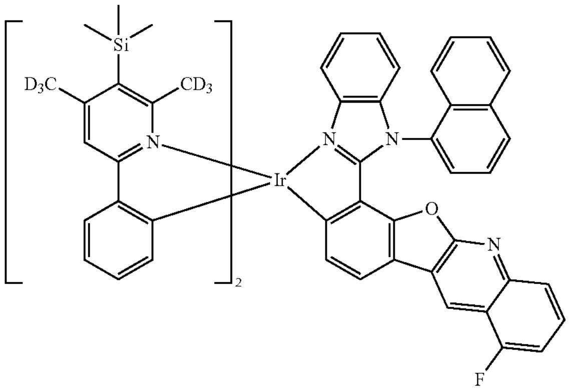
2996
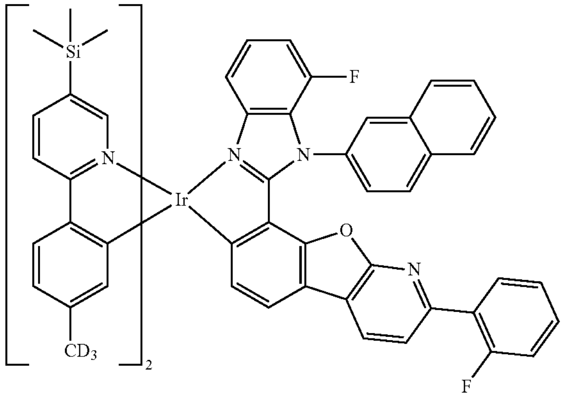
2997
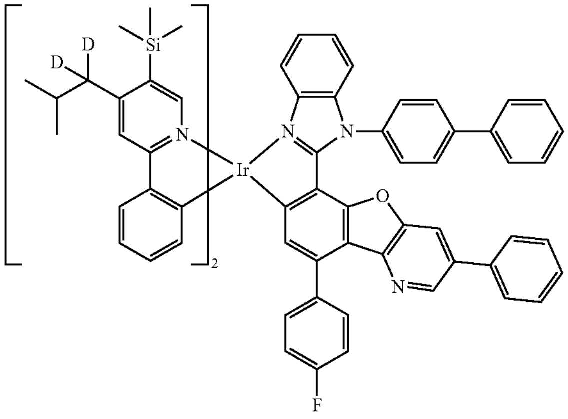
2998
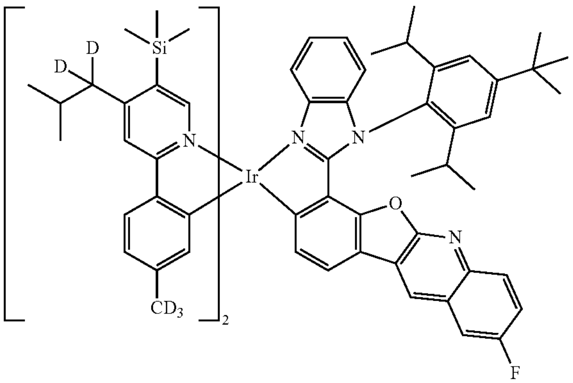
2999
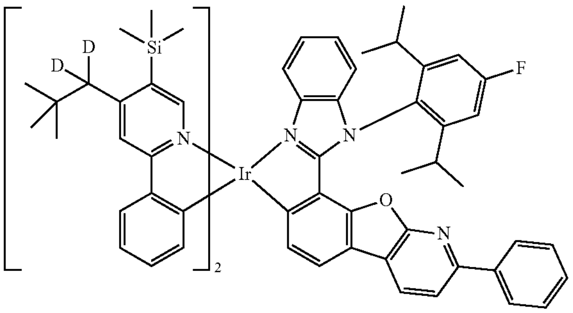

-continued
3000
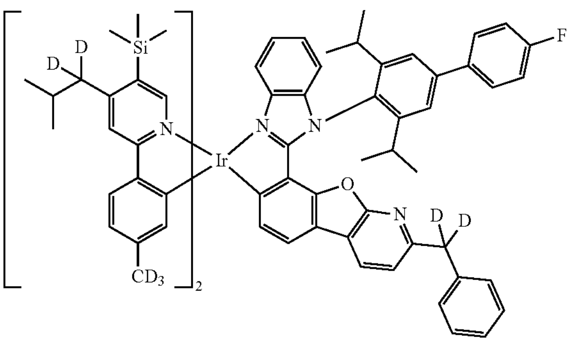
3001
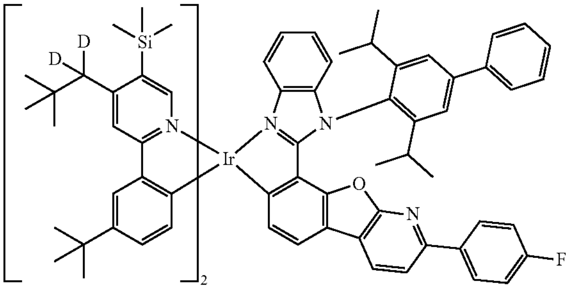
3002
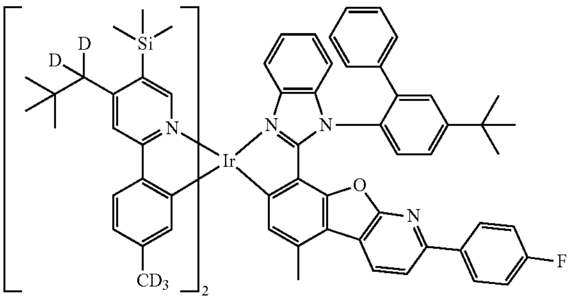
3003
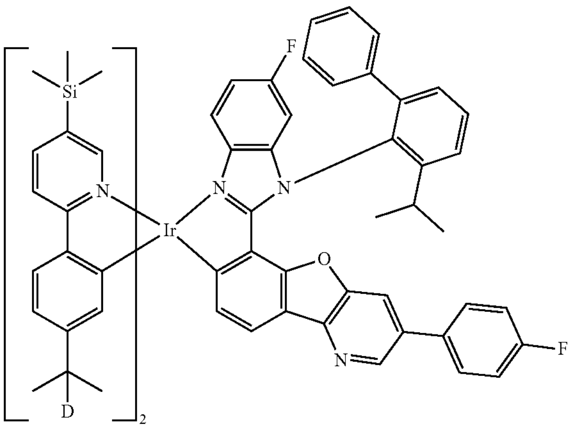
-continued
3004
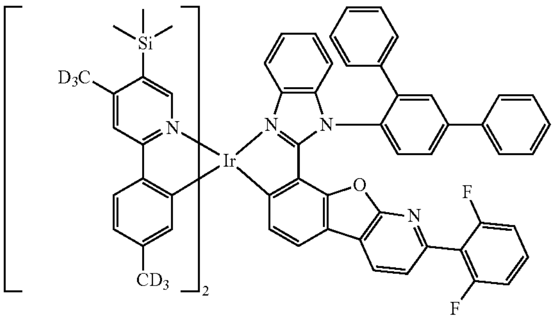
3005
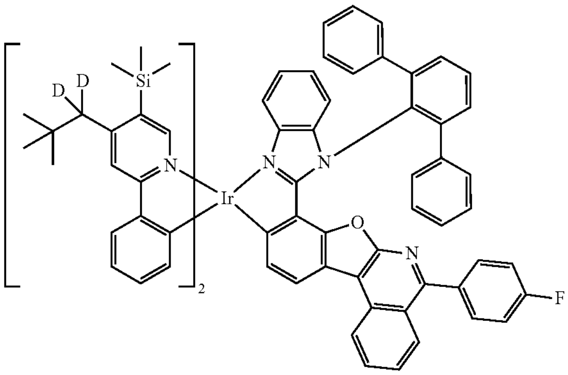
3006
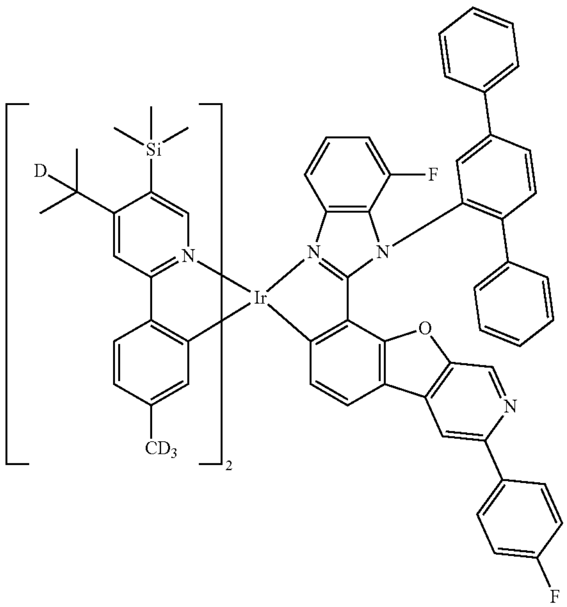

3007
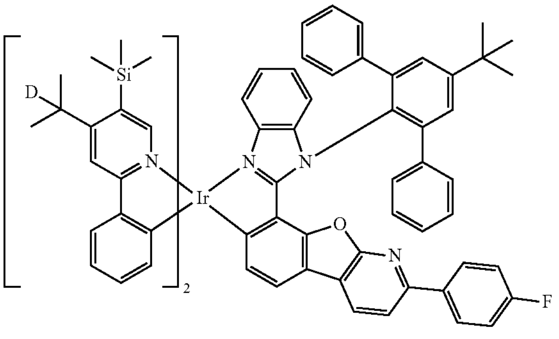
3008
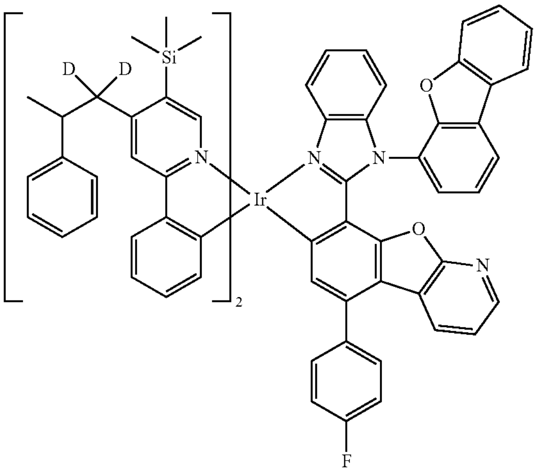
3009
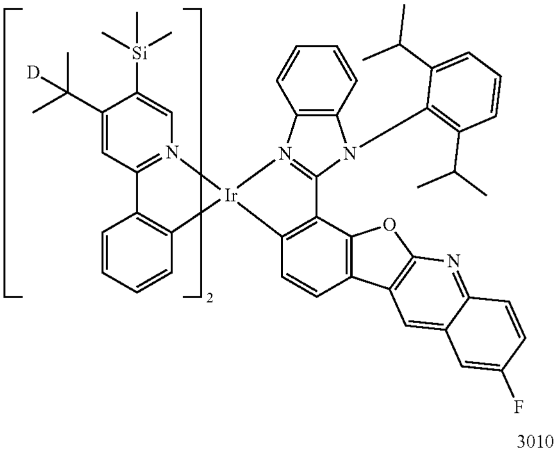
3010
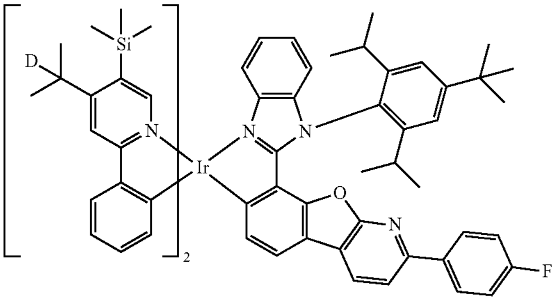
-continued
3011
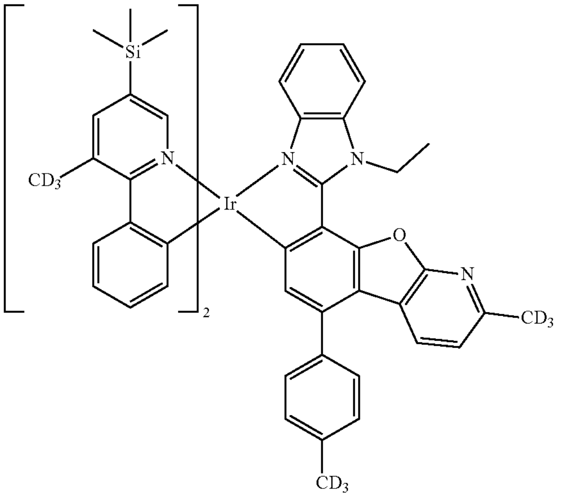
3012
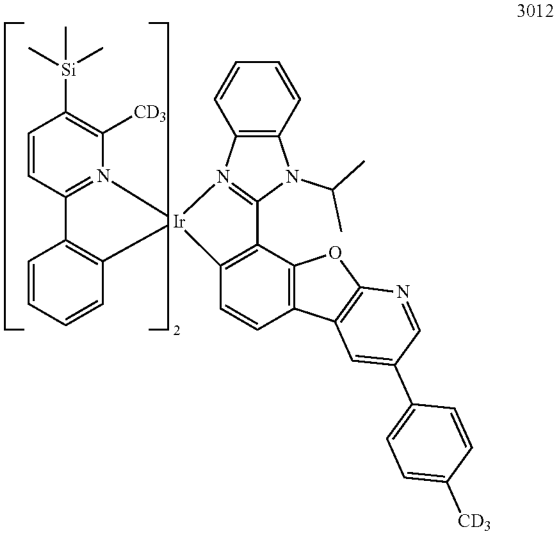
3013
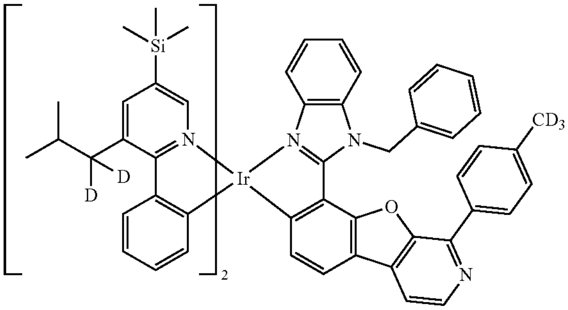

-continued
3014
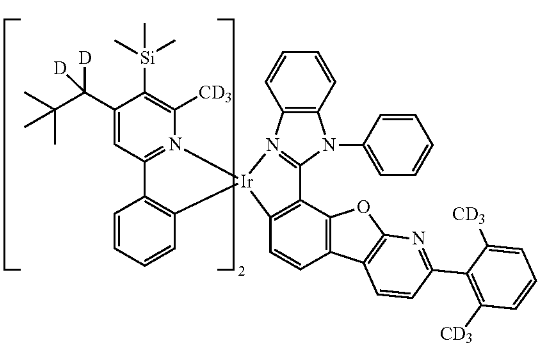
3015
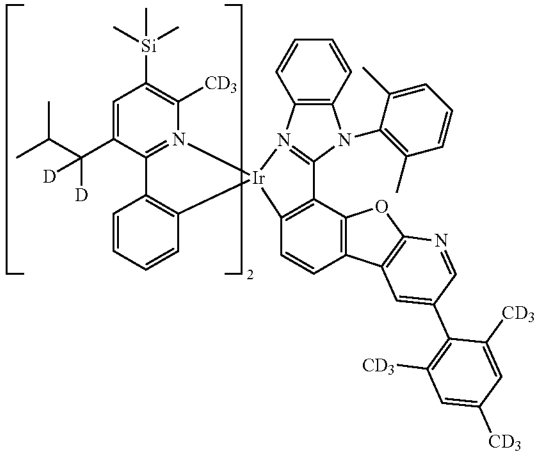
3016
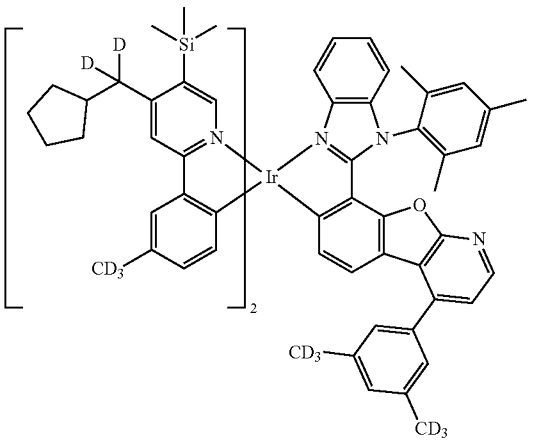
3017
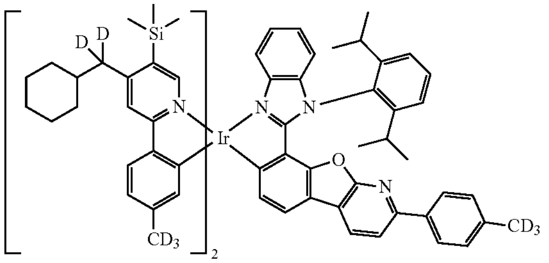
-continued
3018
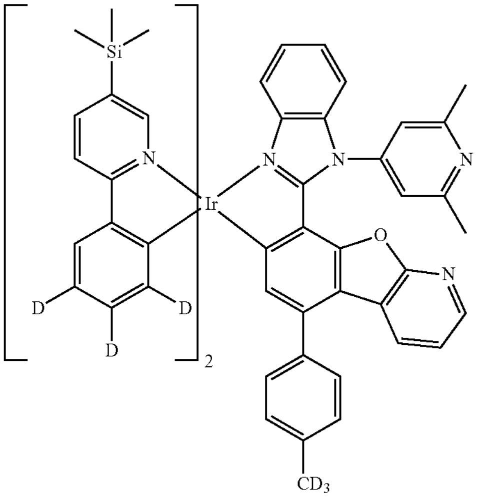
3019
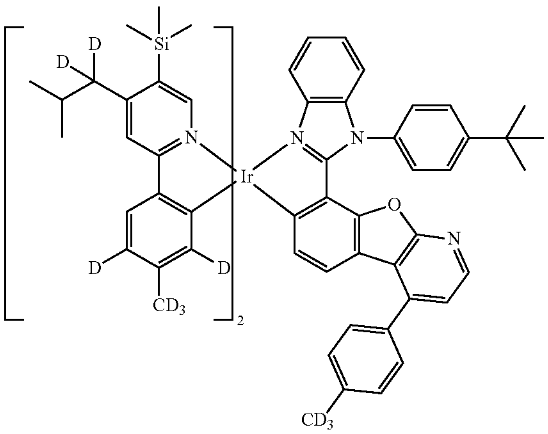
3020
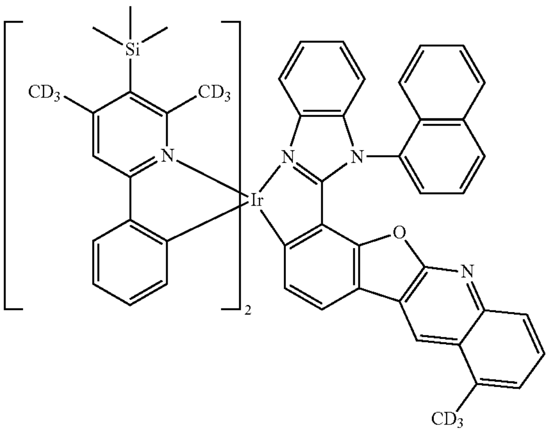

-continued
3021
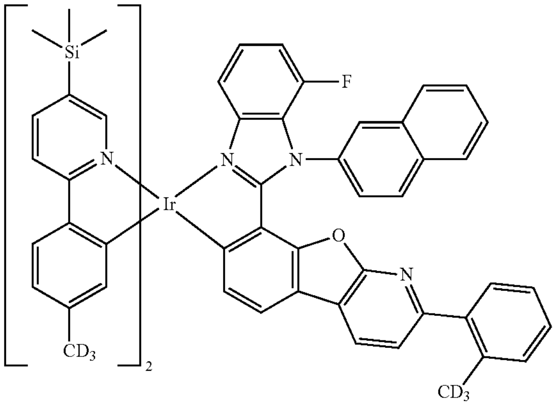
3022
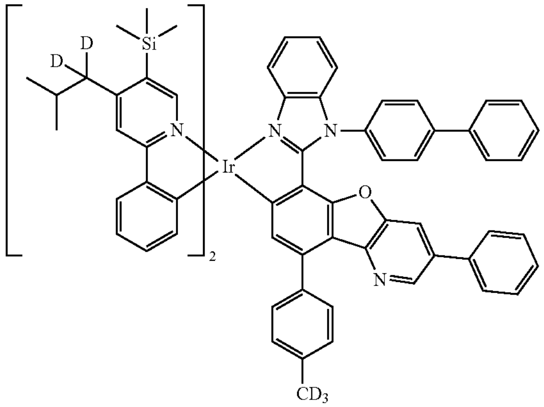
3023
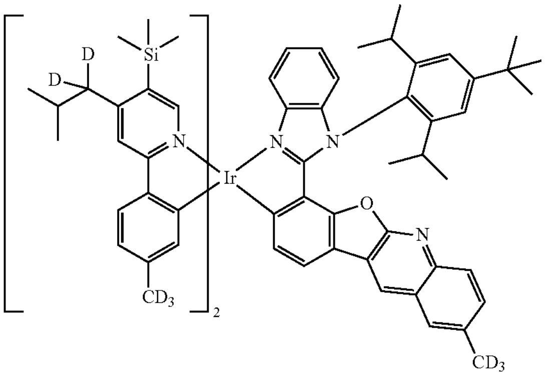
3024
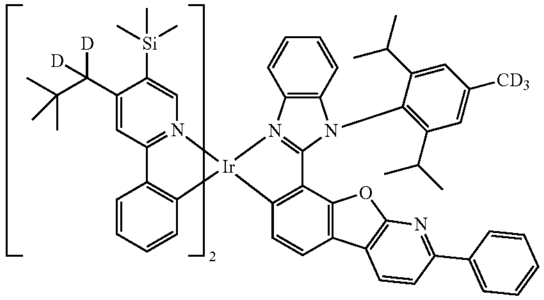
-continued
3025
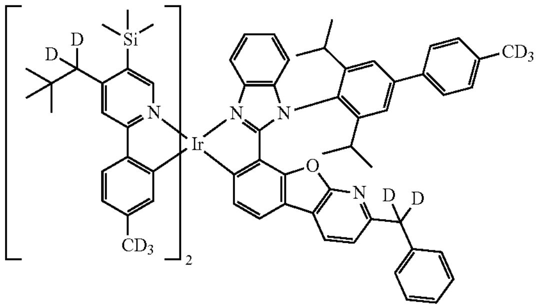
3026
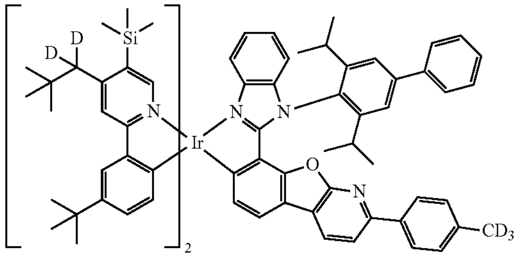
3027
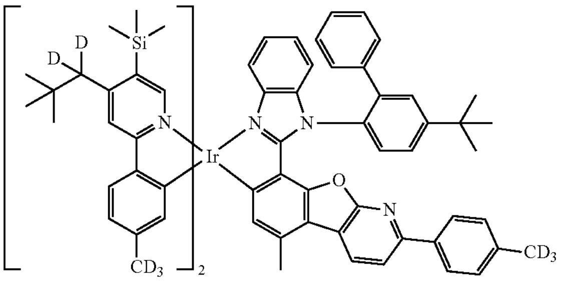
3028
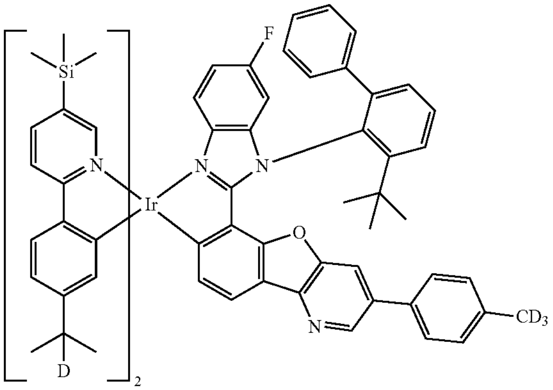

-continued
3029
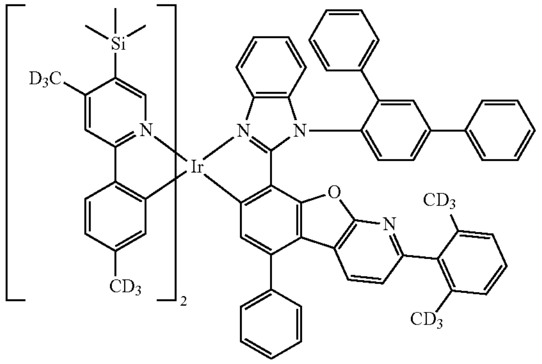
3030
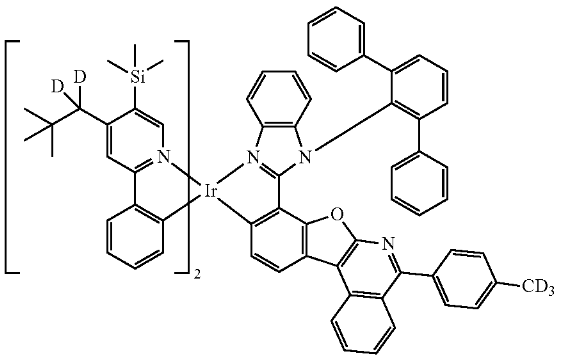
3031
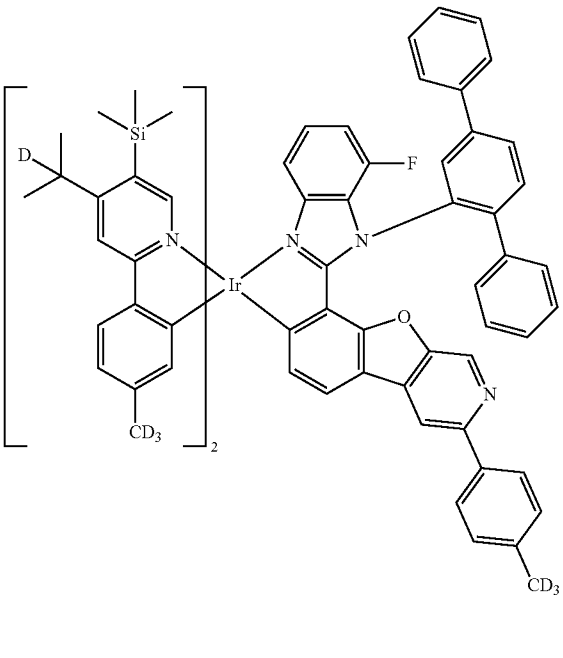
-continued
3032
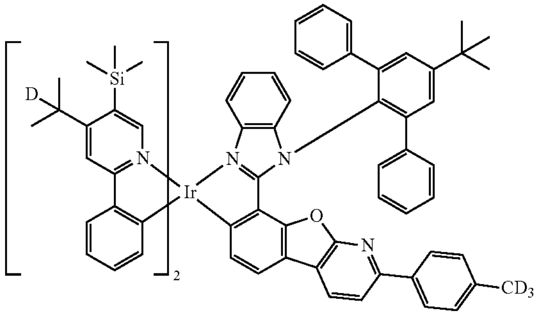
3033
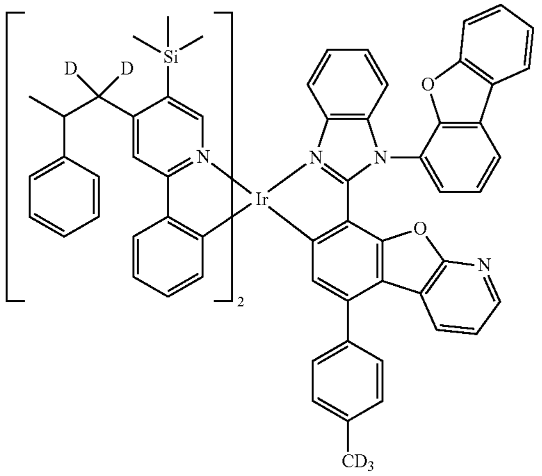
3034
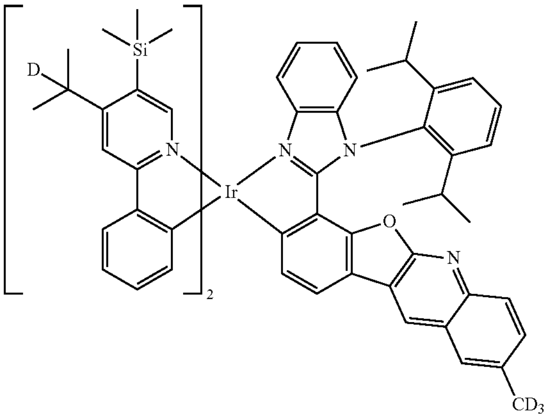
3035
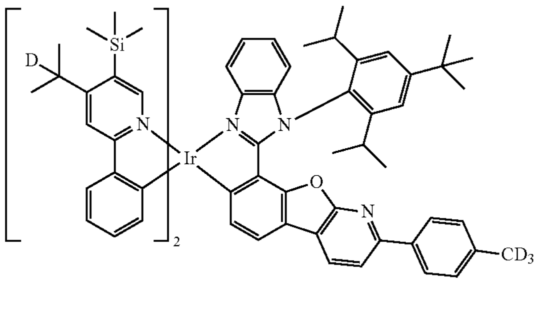

-continued
3036
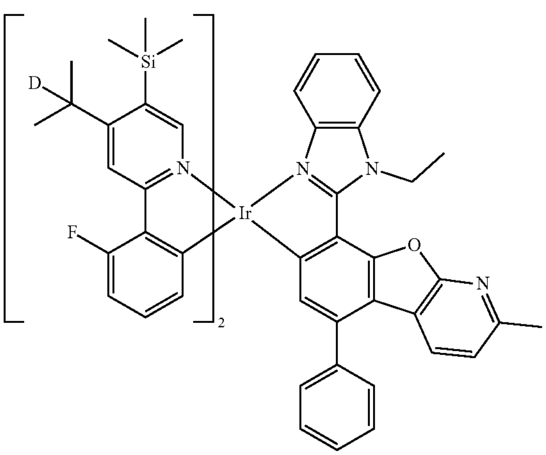
3037
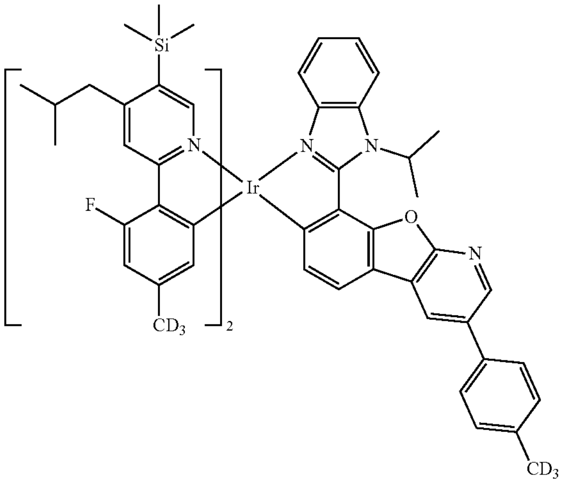
3038
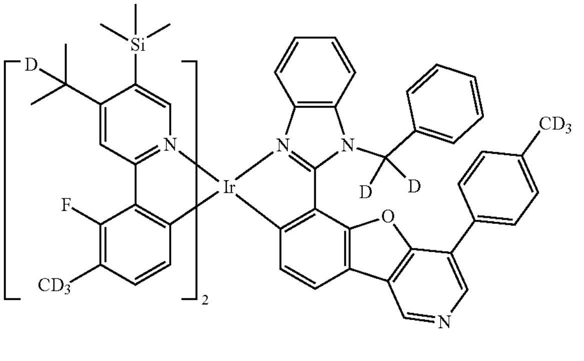
-continued
3039
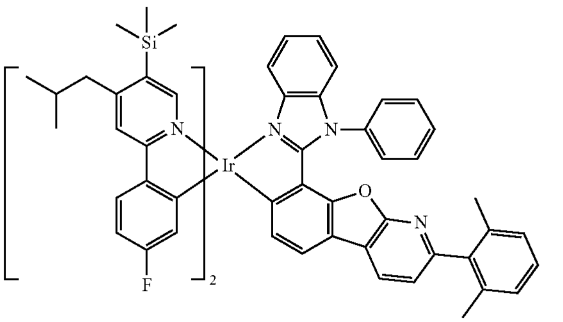
3040
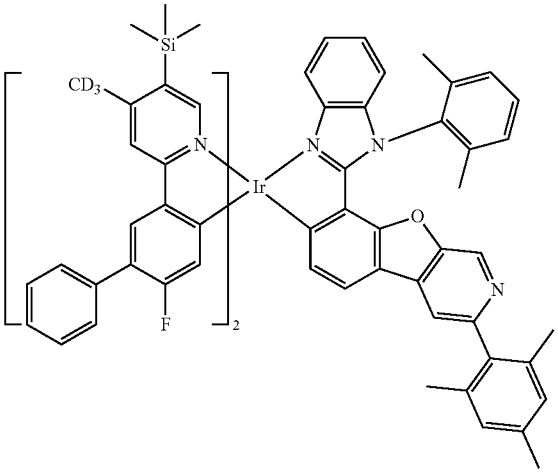
3041
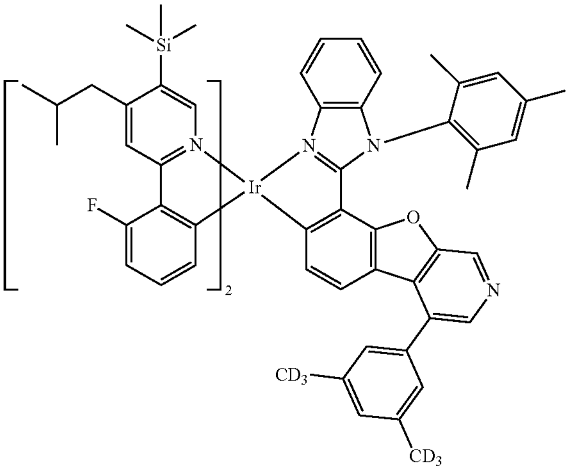
3042
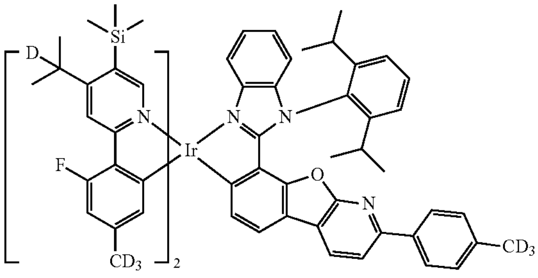

3043
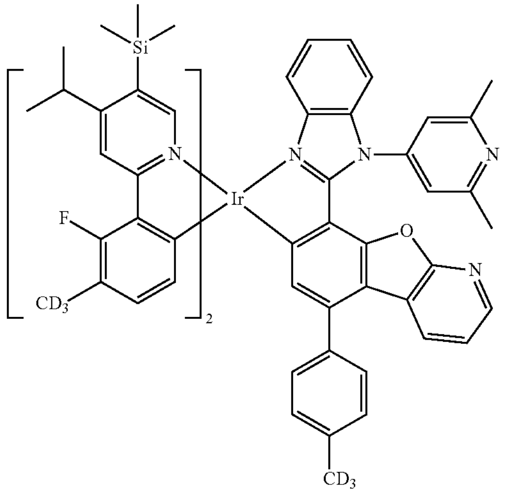
3044
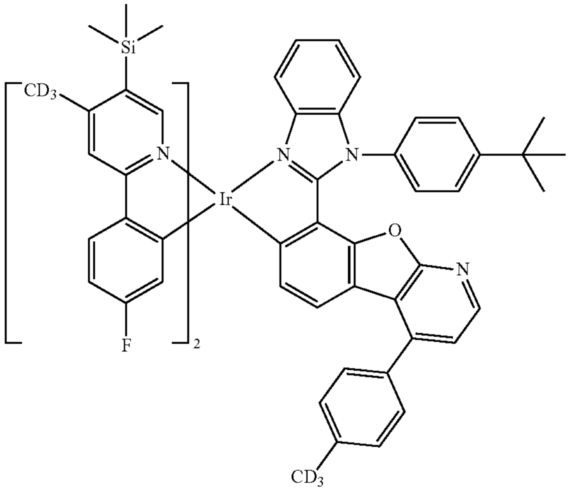
3045
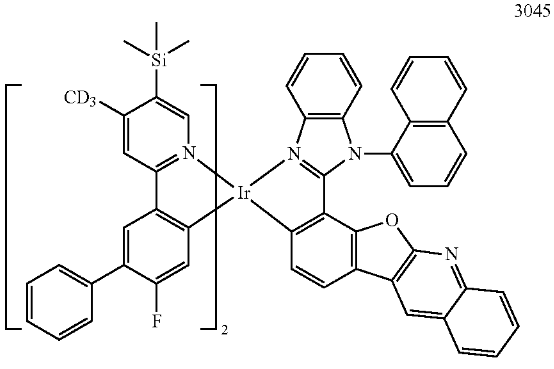
3046
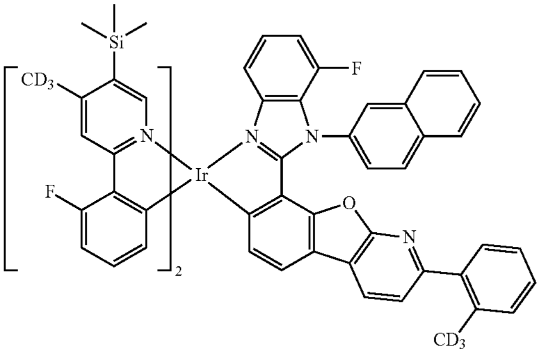
3047
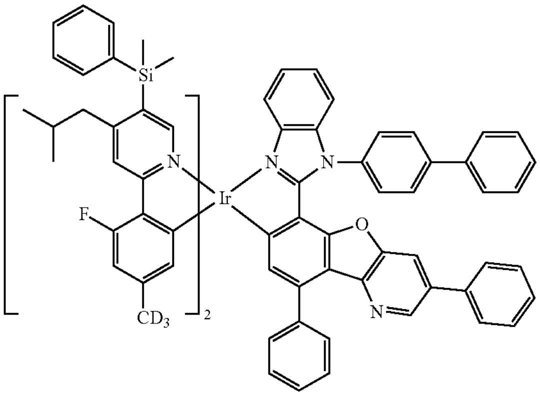
3048
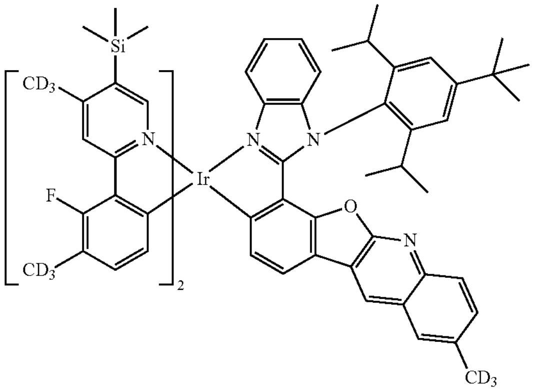
3049
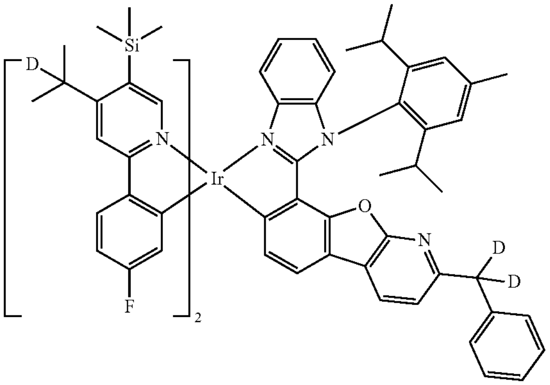

-continued
3050
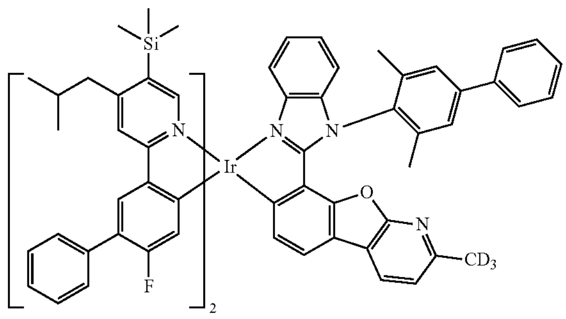
3051
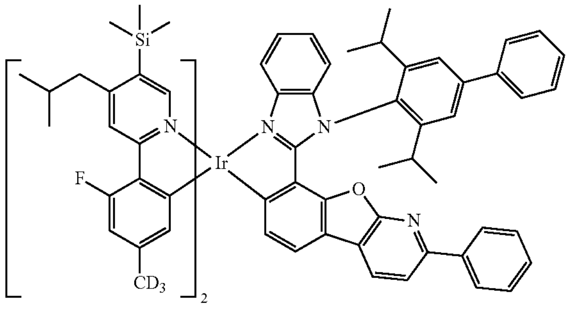
3052
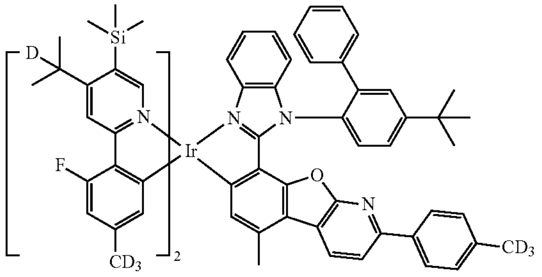
3053
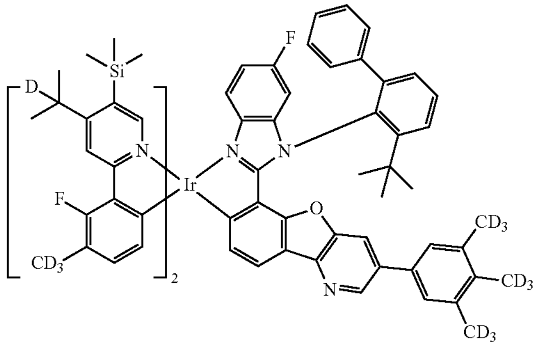
-continued
3054
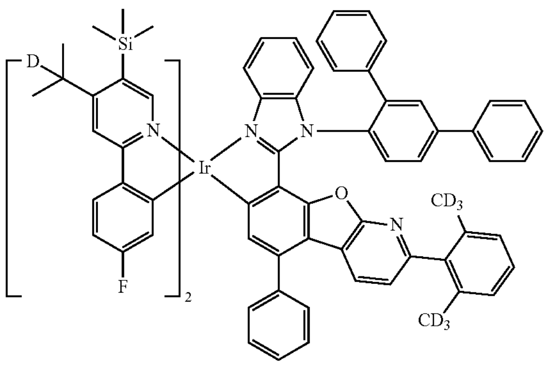
3055
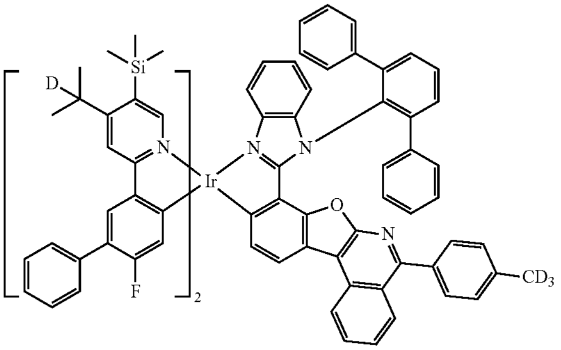
3056
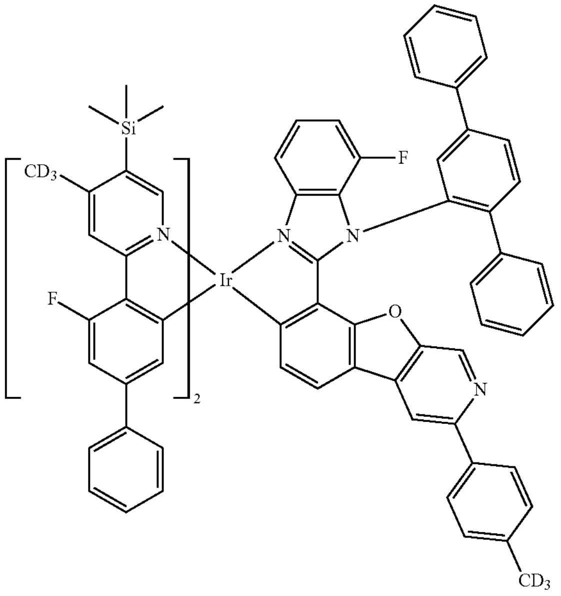

-continued
3057
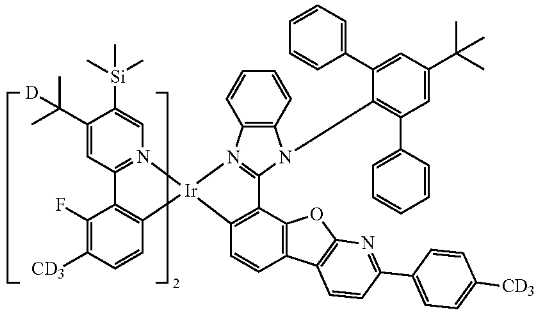
3058
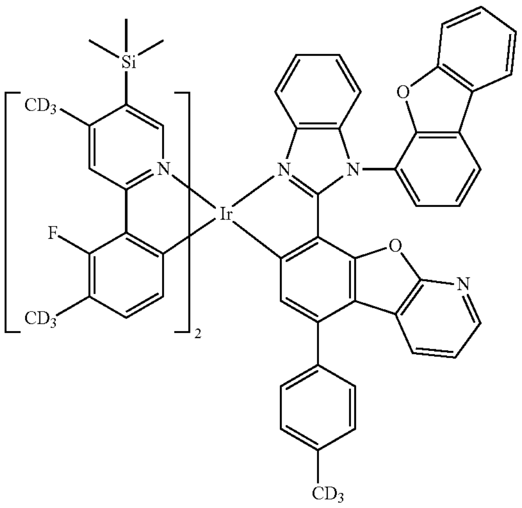
3059
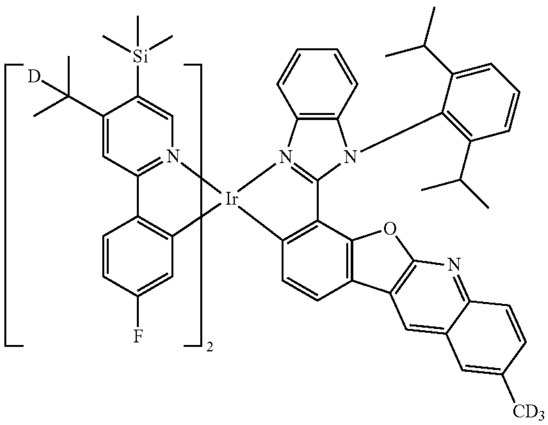
3060
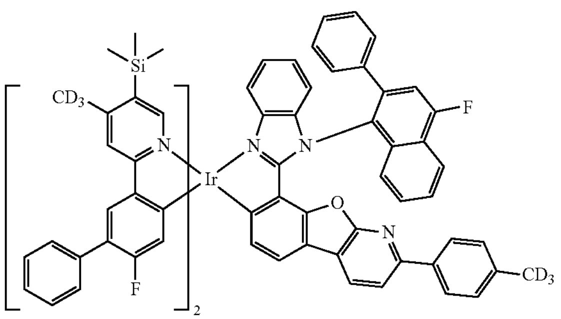
-continued
3061
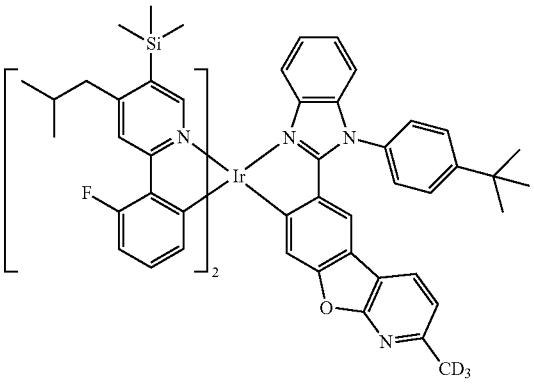
3062
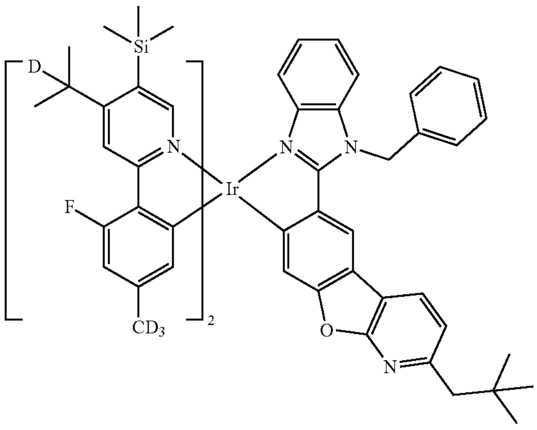
3063
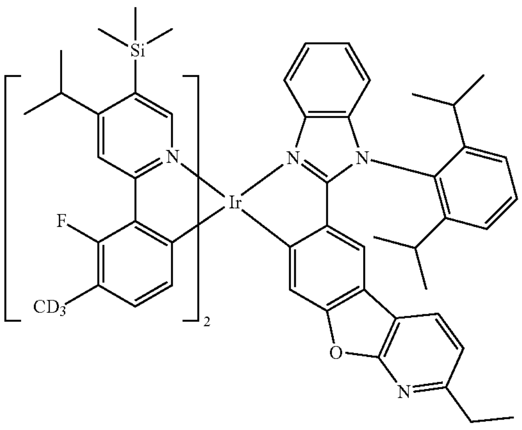

-continued
3064
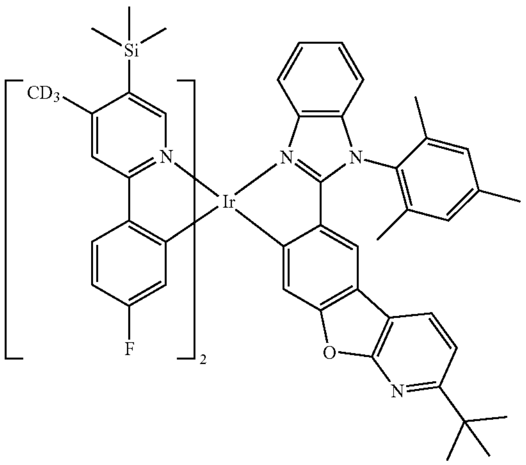
3065
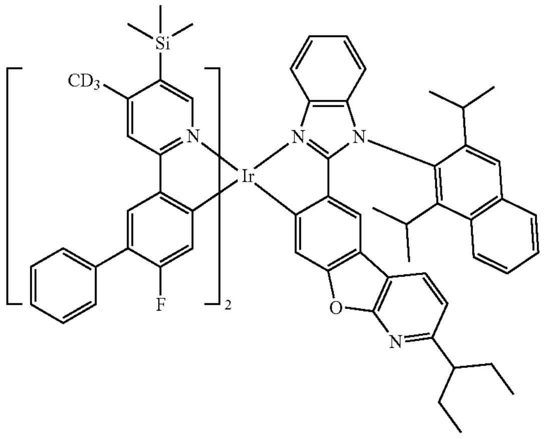
3066
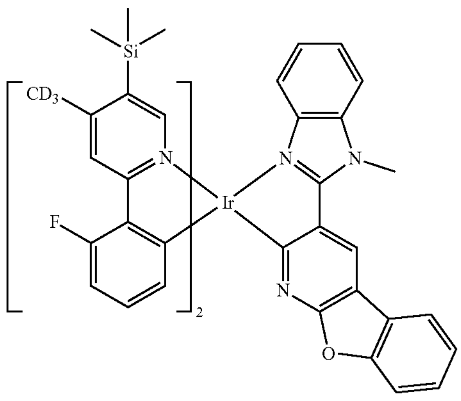
-continued
3067
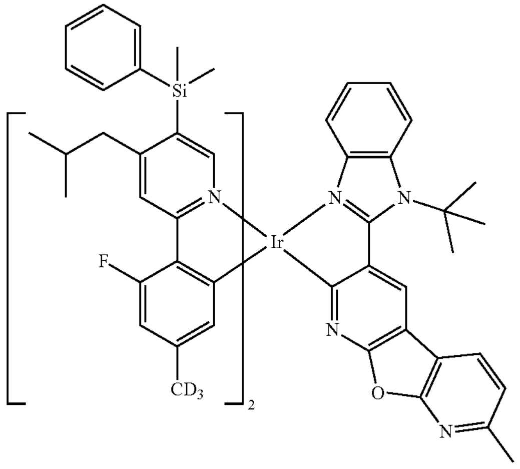
3068
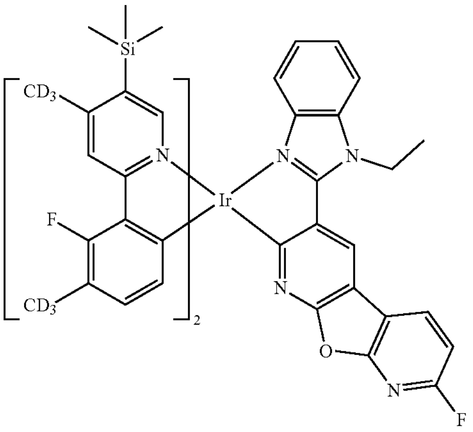
3069
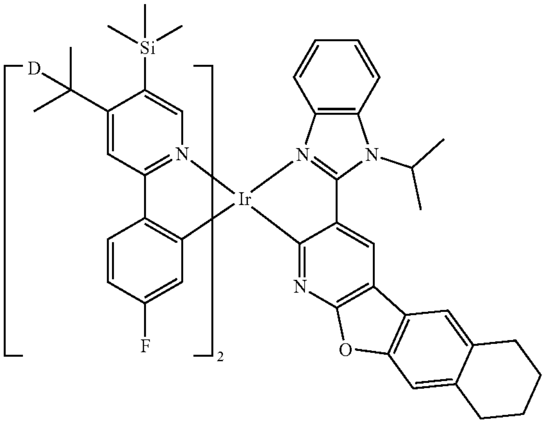

3070
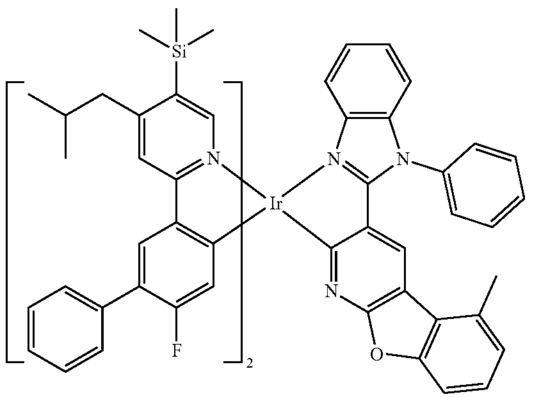
3071
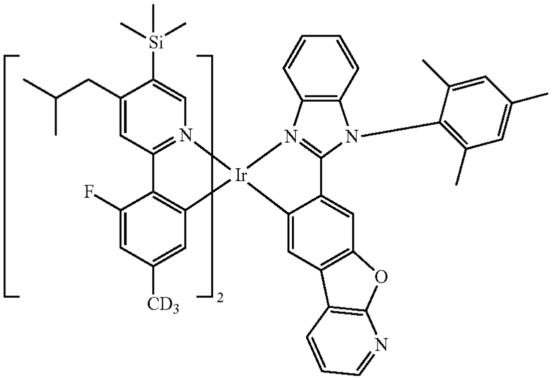
3072
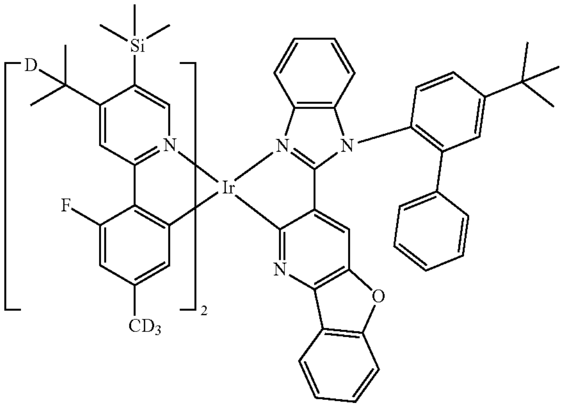
3073
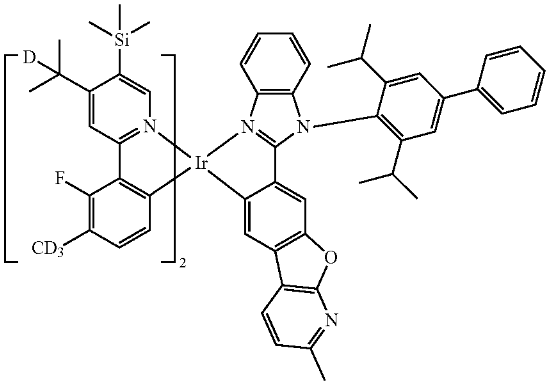
3074
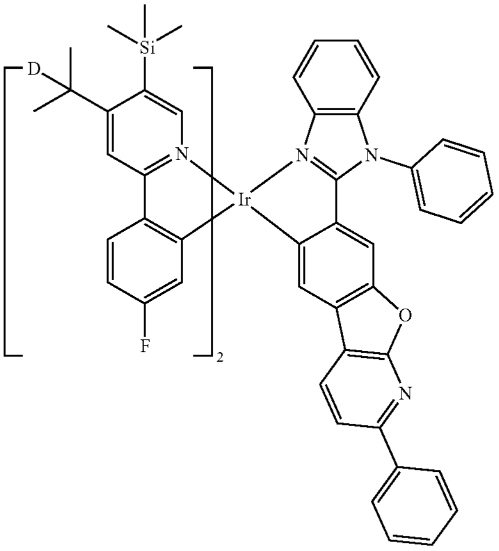
3075
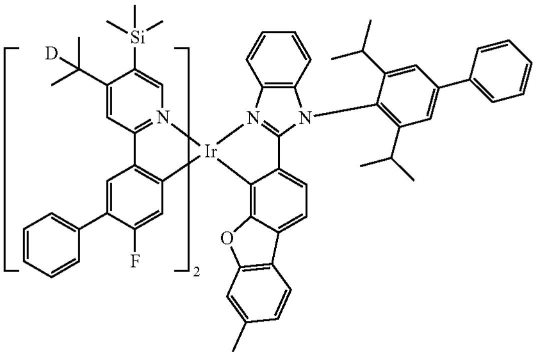
3076
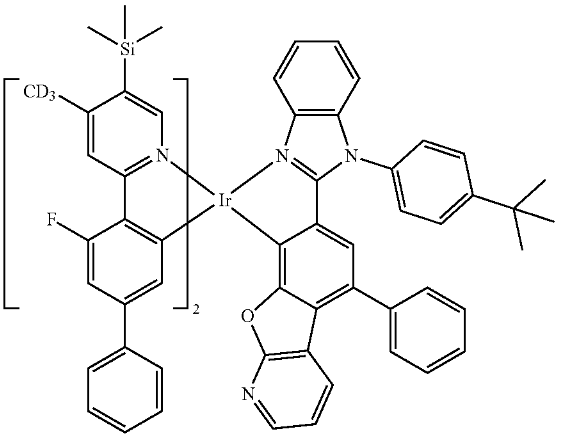

-continued
3077
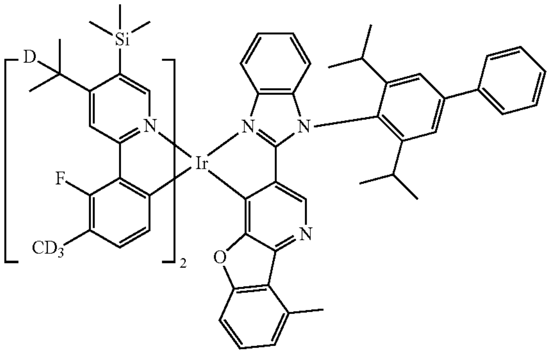
3078
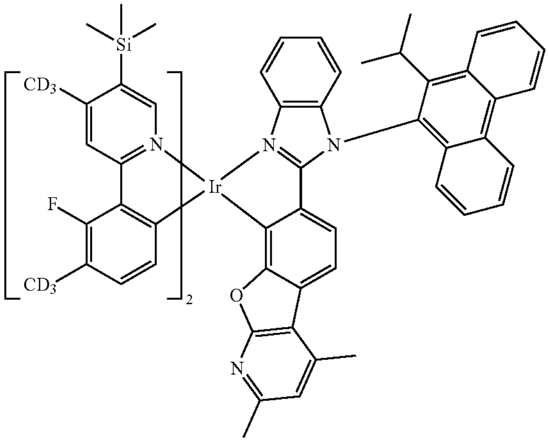
3079
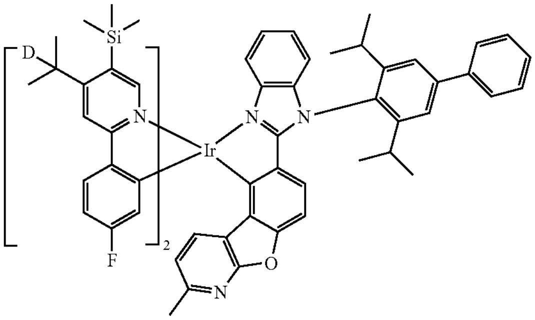
3080
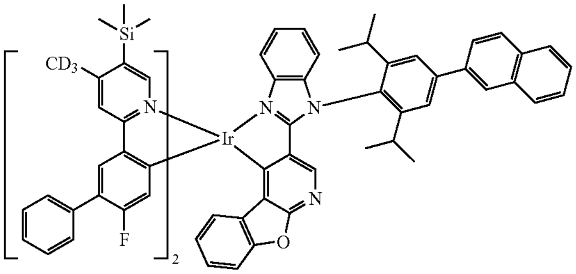
-continued
3081
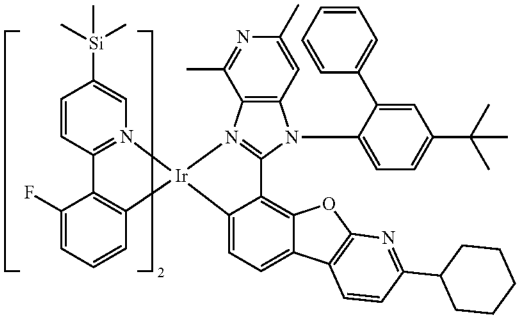
3082
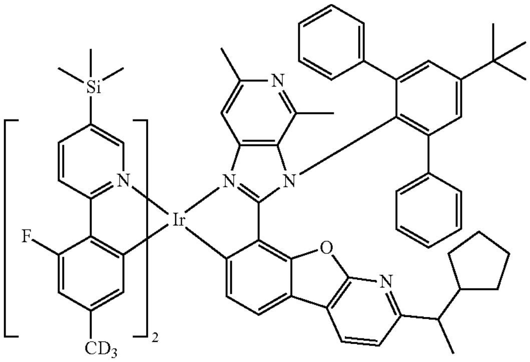
3083
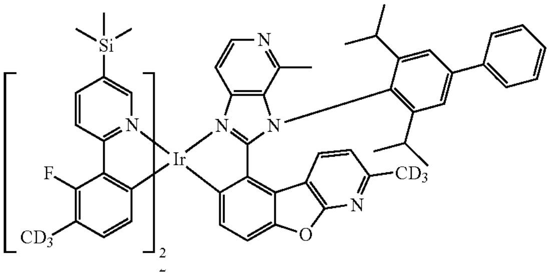
3084
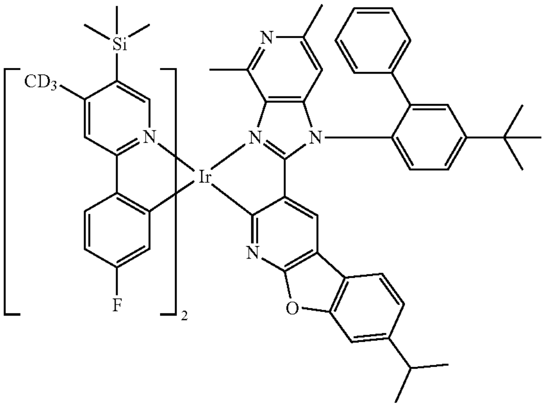

-continued
3085
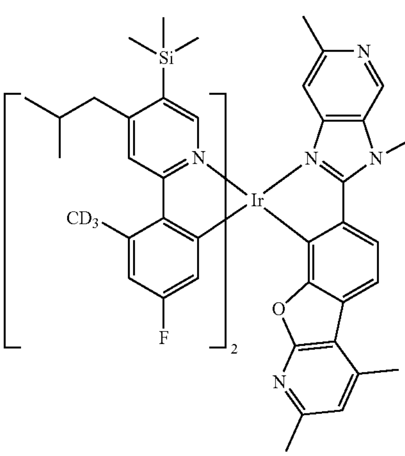
3086
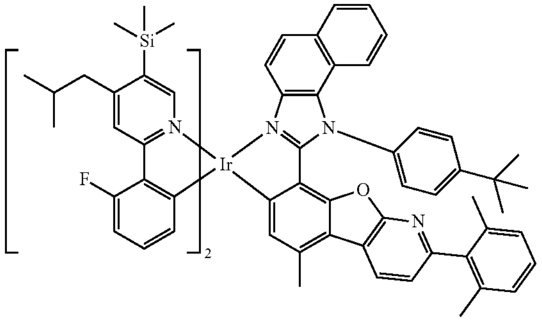
3087
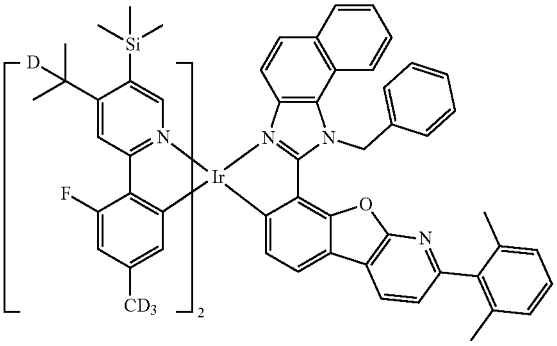
3088
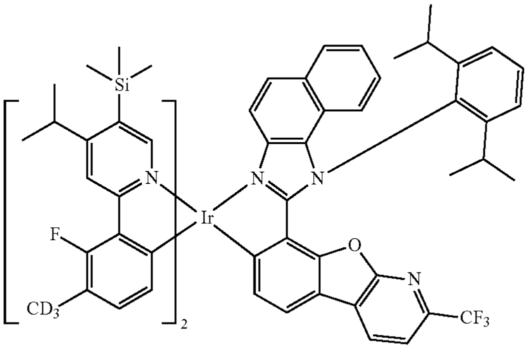
-continued
3089
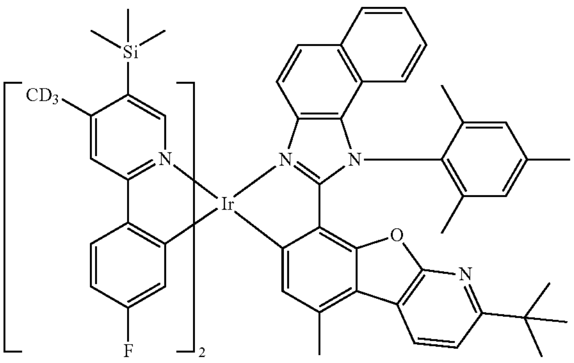
3090
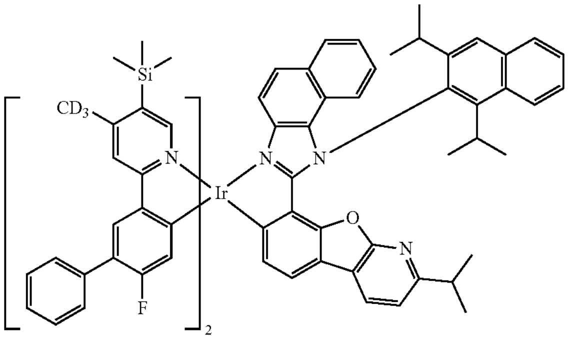
3091
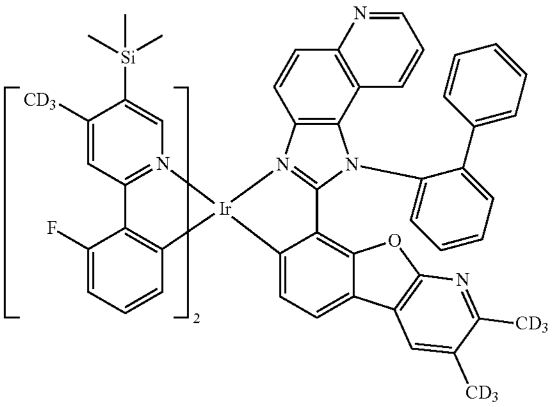
3092
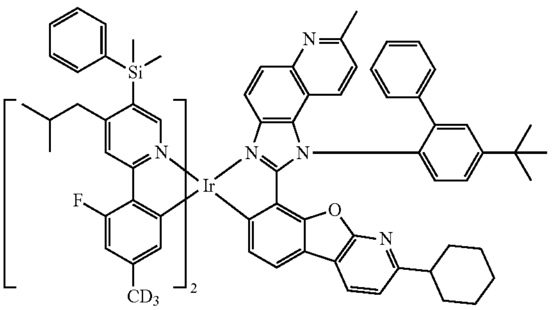

-continued
3093
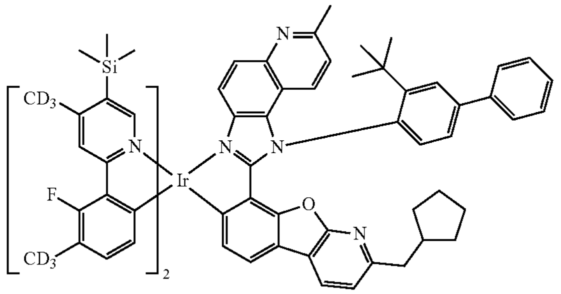
3094
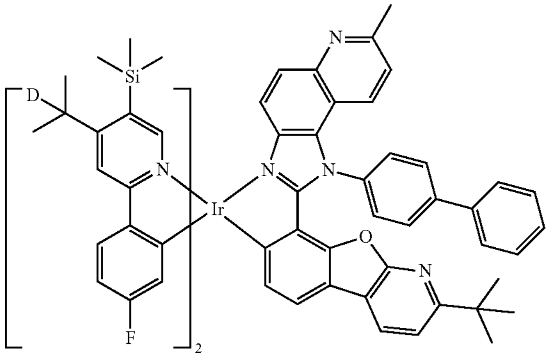
-continued
3095
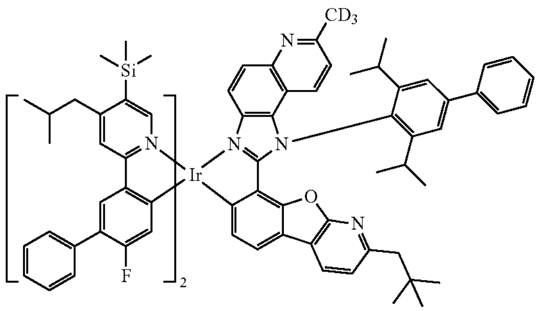
3096
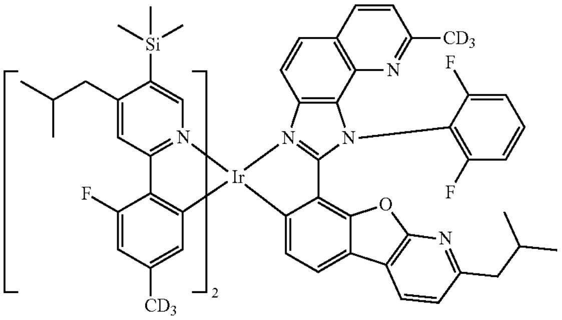
3097
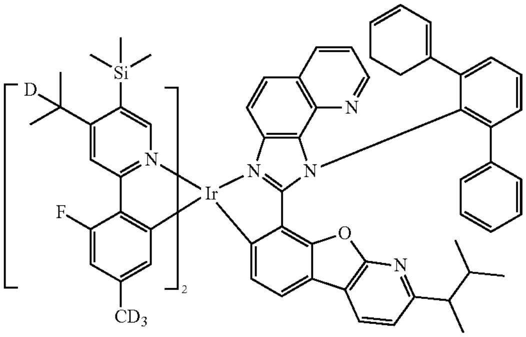
3098
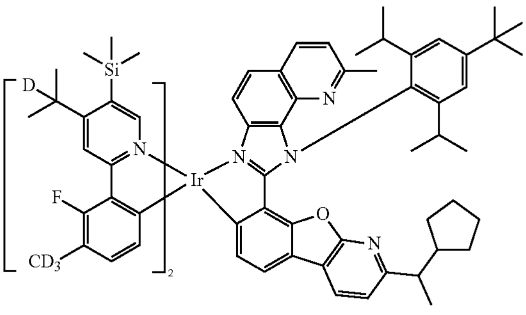
3099
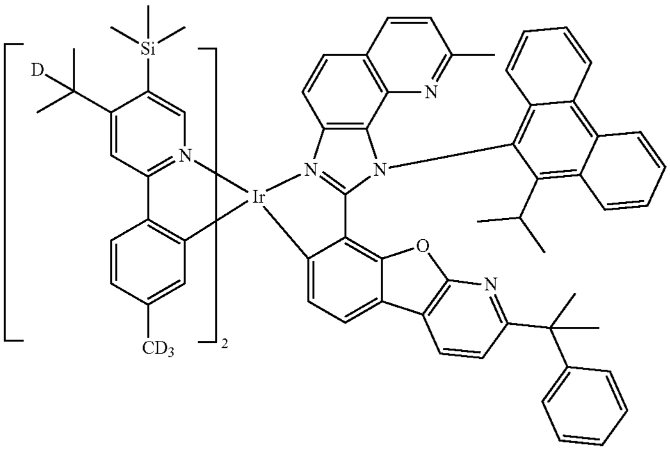

-continued
3100
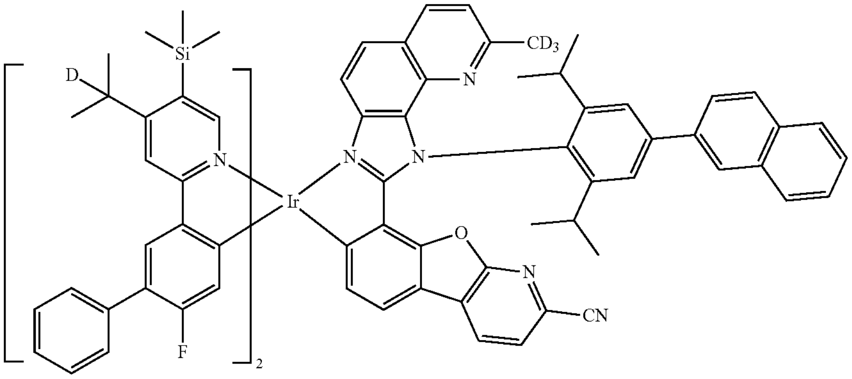
3101
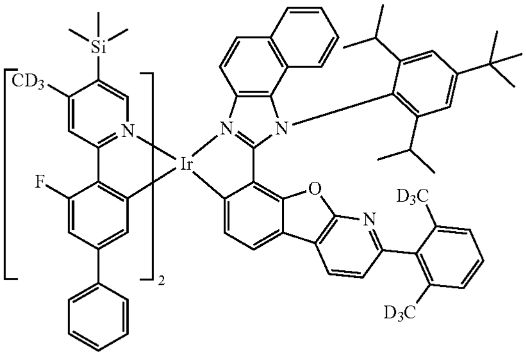
3102
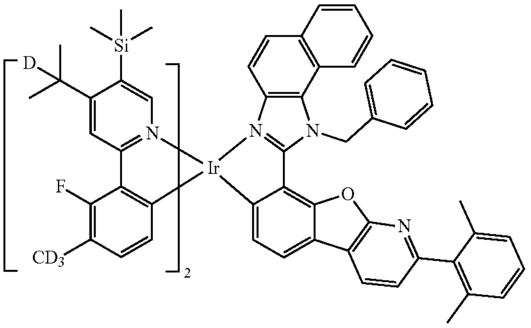
3103
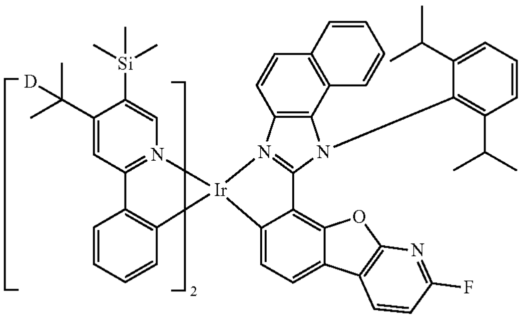
3104
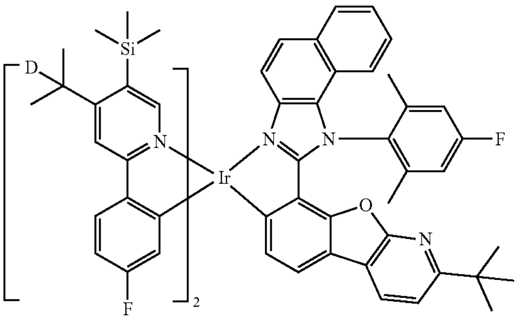
3105
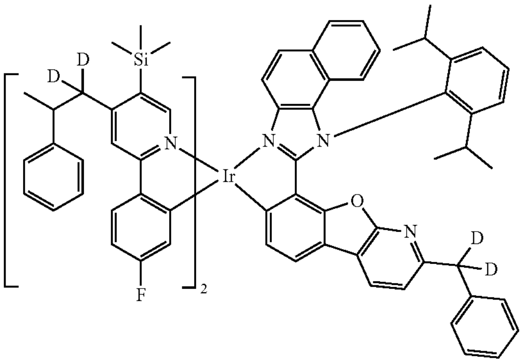
3106
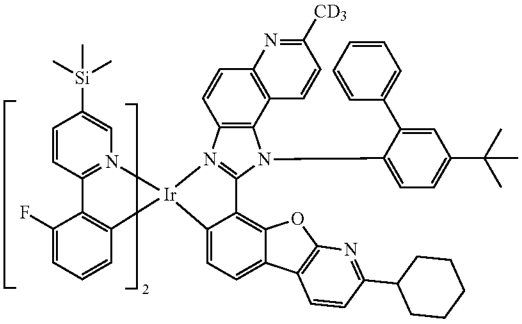

-continued
3107
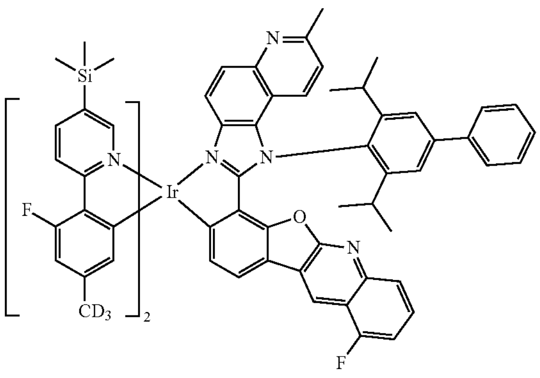
3108
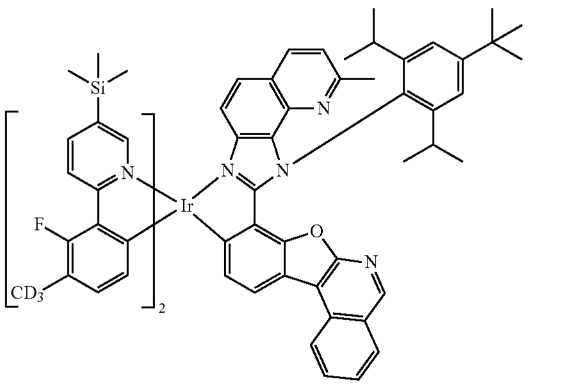
3109
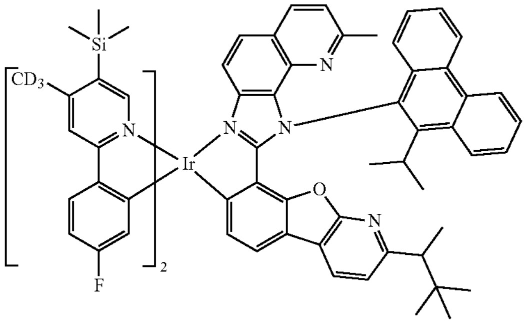
3110
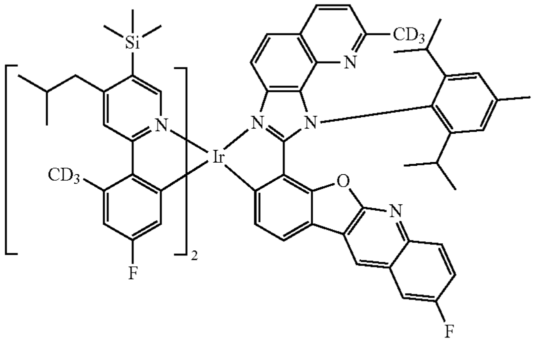
3111
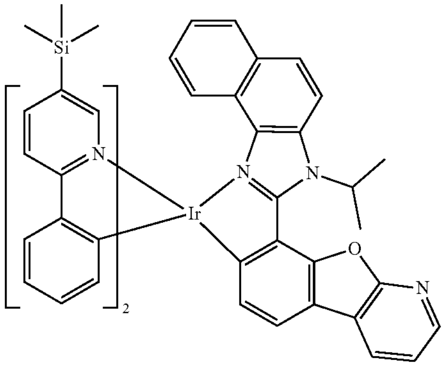
3112
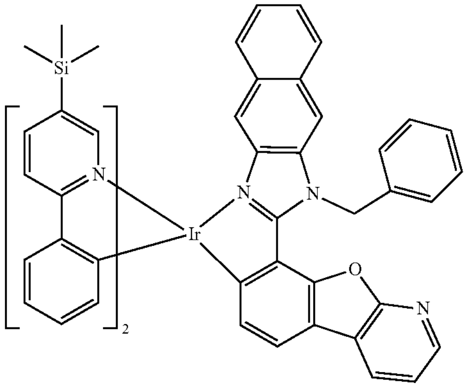
3113
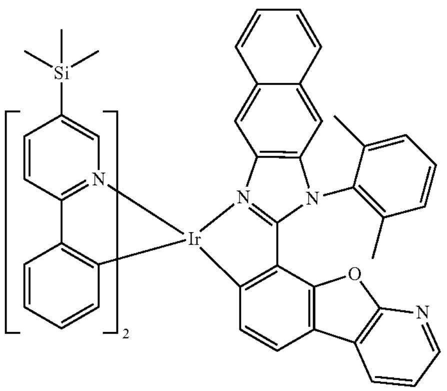
3114
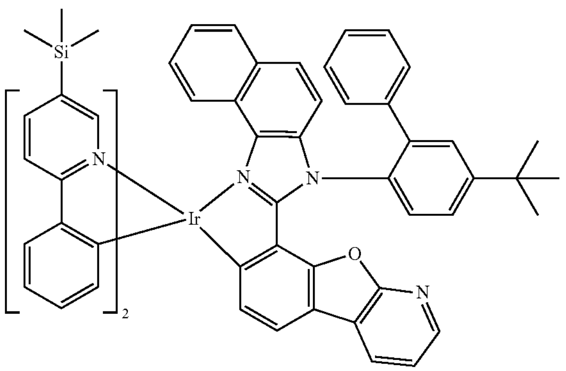

-continued
3115
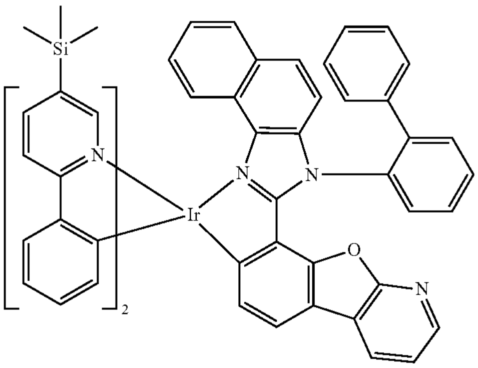
3116
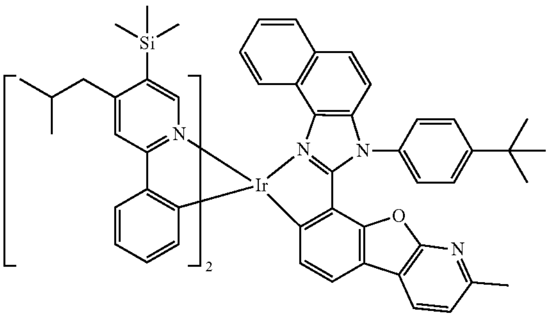
3117
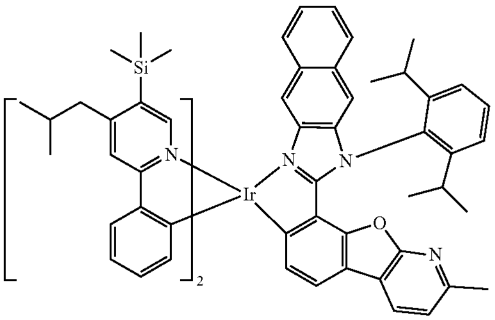
3118
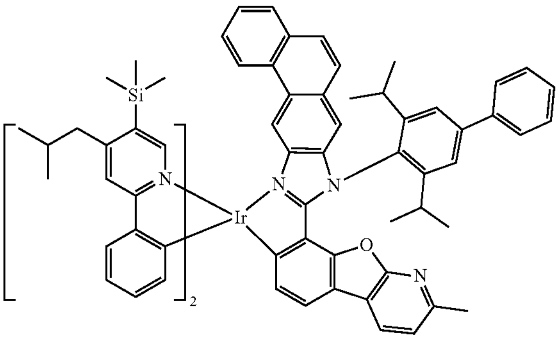
3119
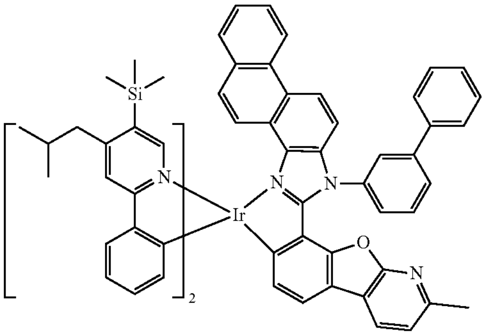
3120
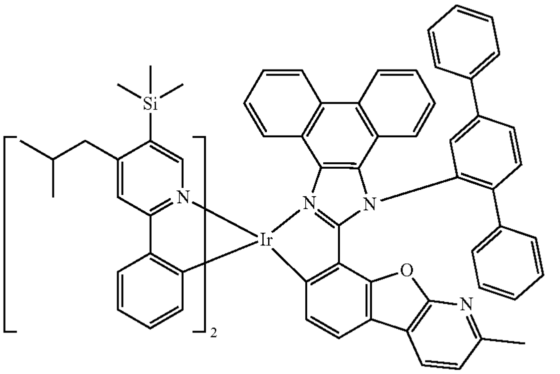
3121
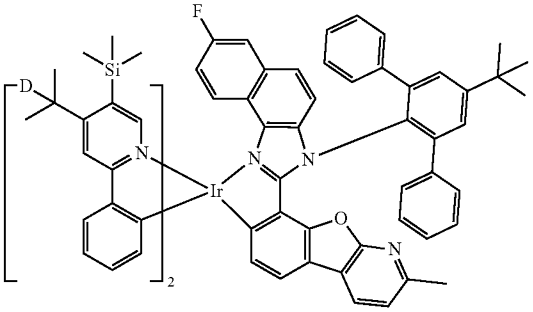
3122
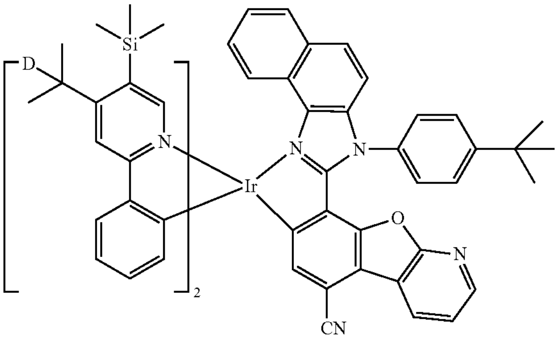

-continued
3123
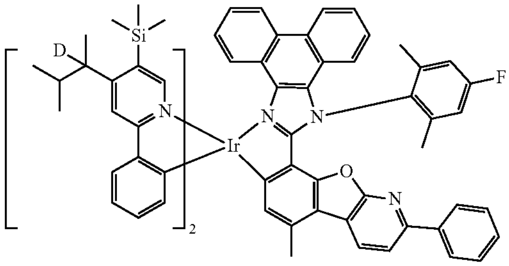
3124
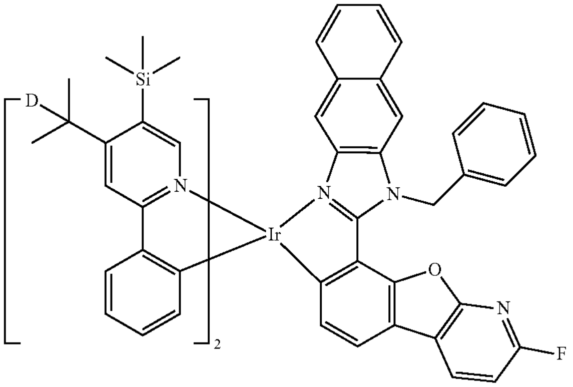
3125
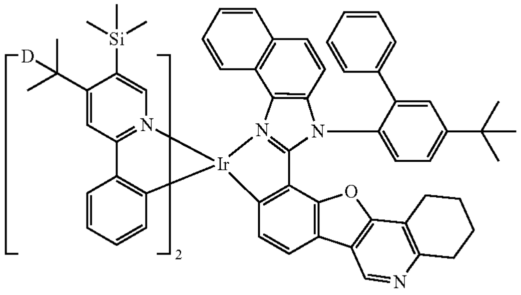
3126
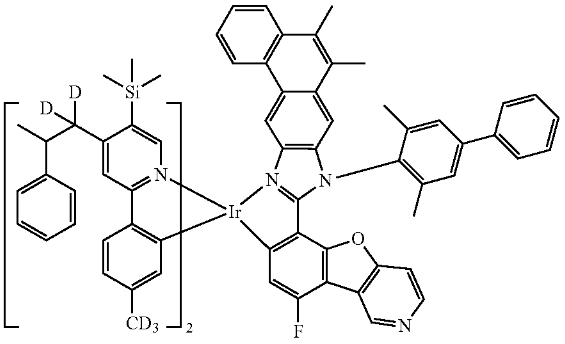
3127
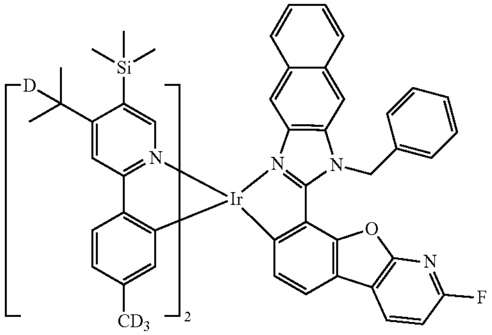
3128
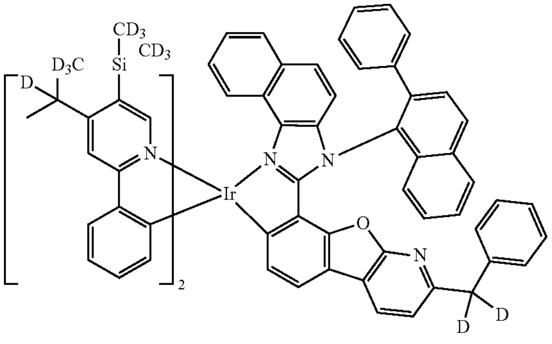
3129
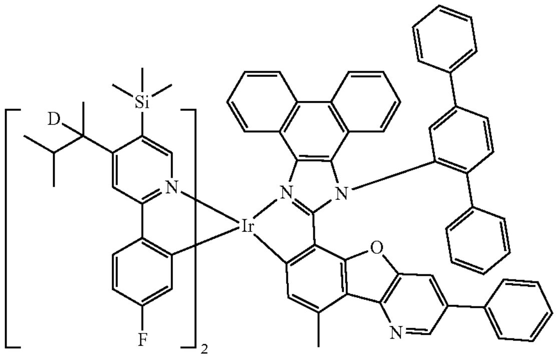
3130
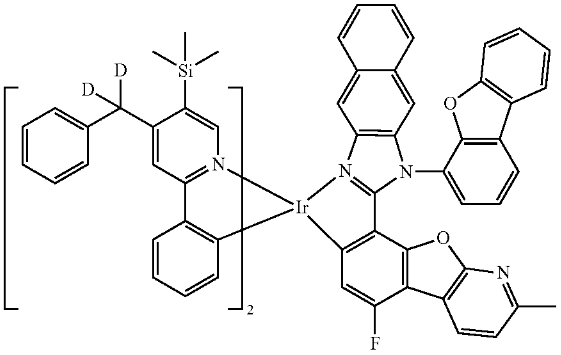

-continued
3131
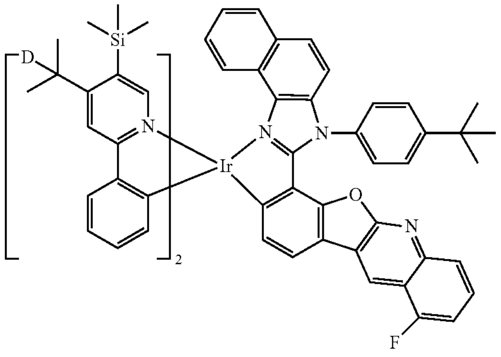
3132
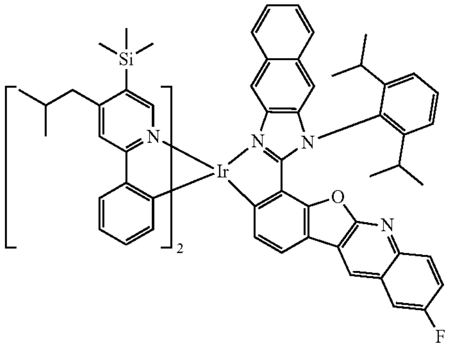
3133
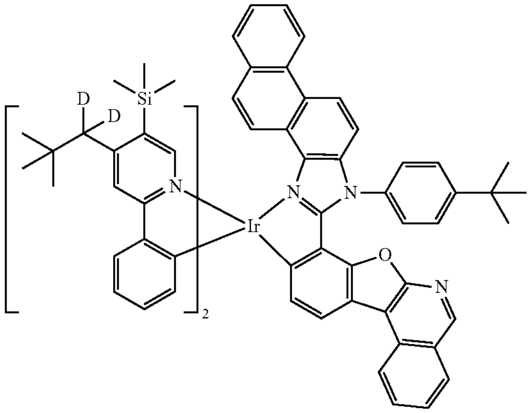
3134
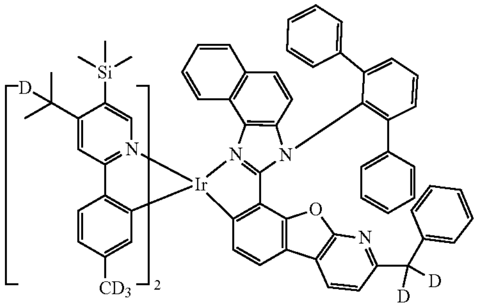
3135
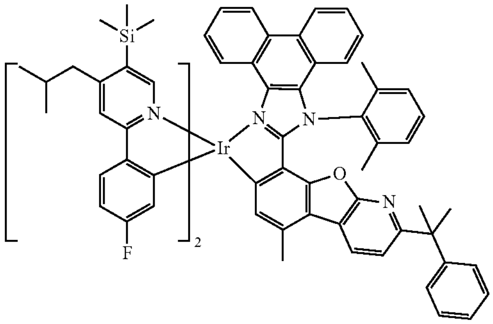
3136
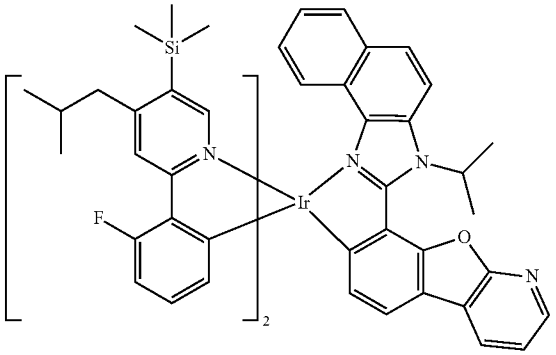
3137
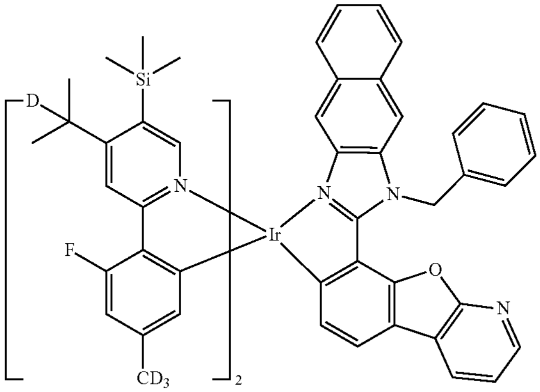
3138
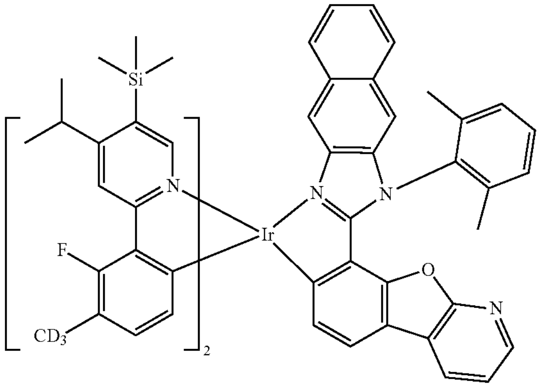

-continued
3139
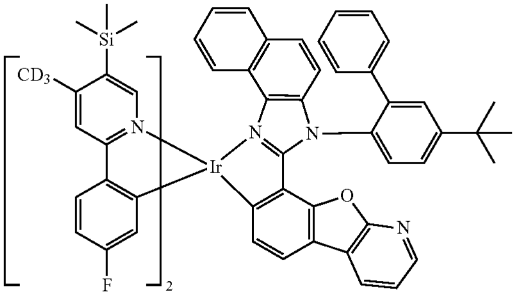
3140
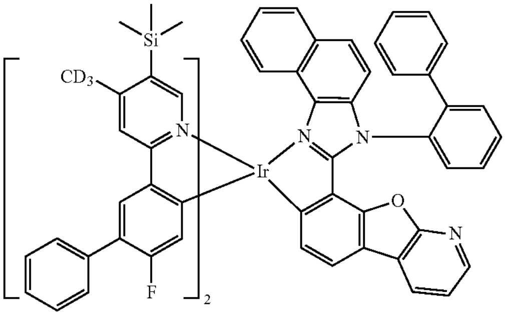
3141
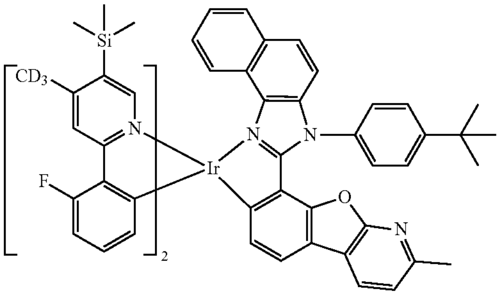
3142
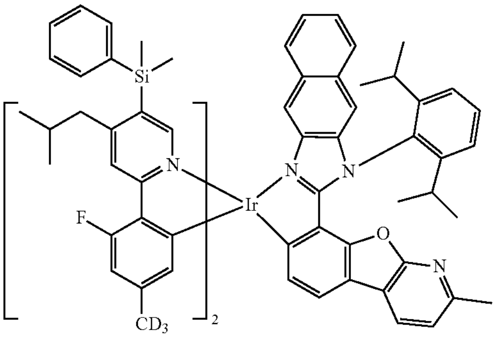
3143
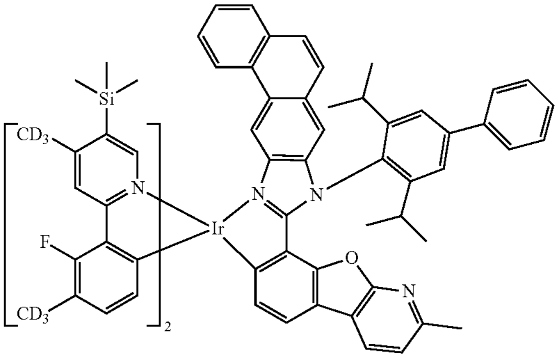
3144
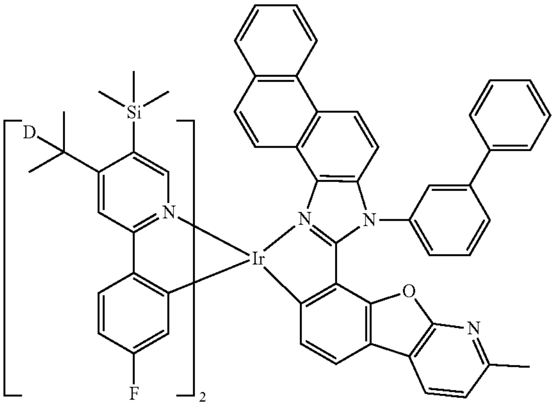
3145
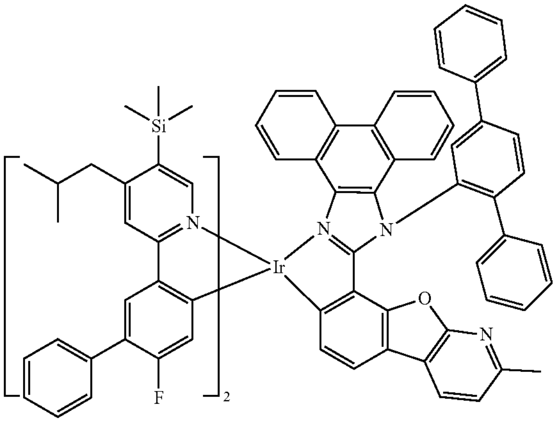
3146
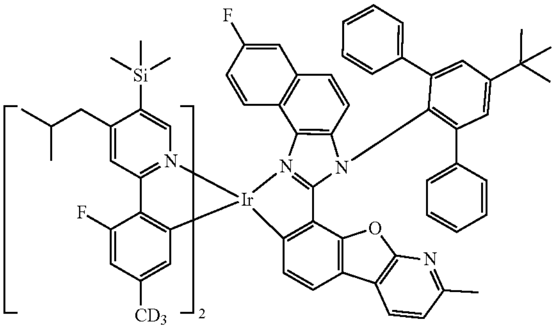

-continued
3147
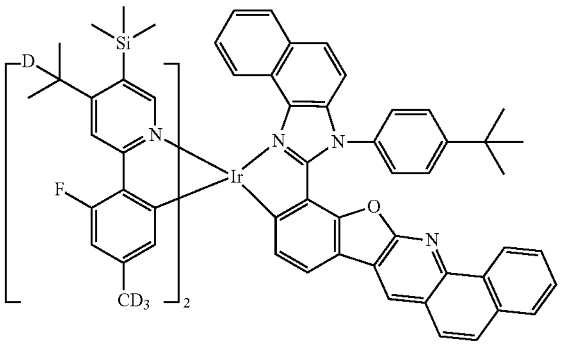
3148
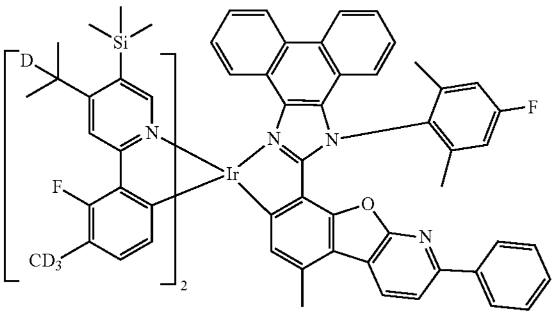
3149
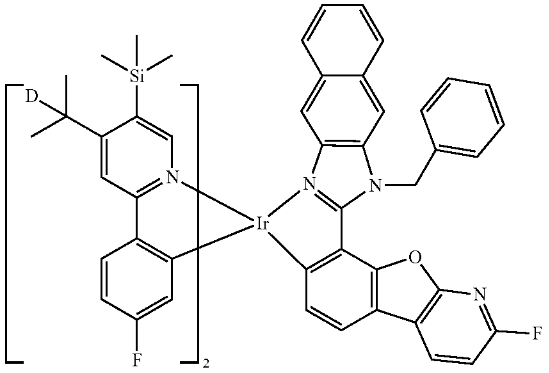
3150
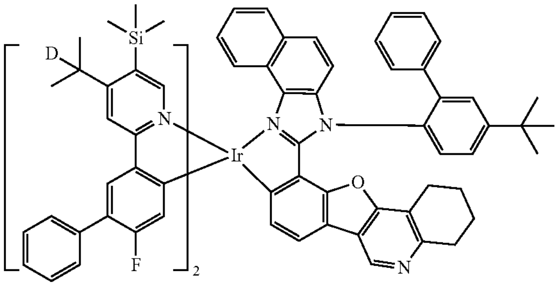
3151
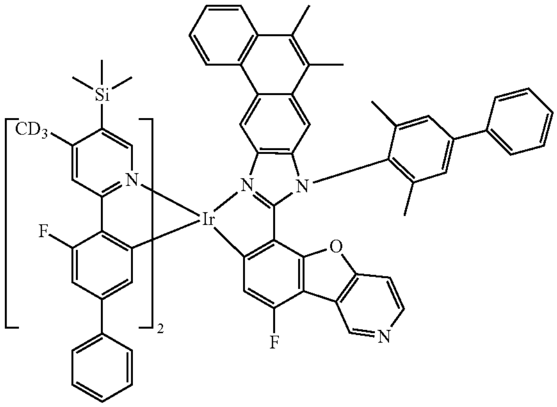
3152
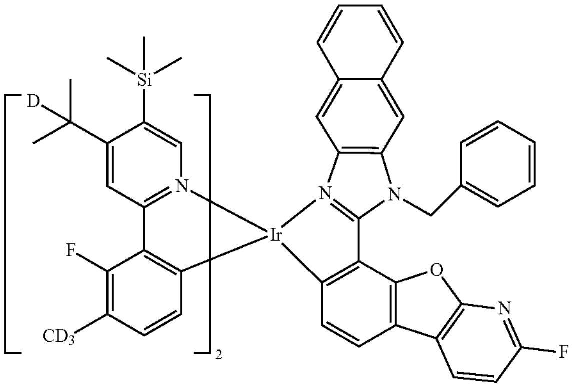
3153
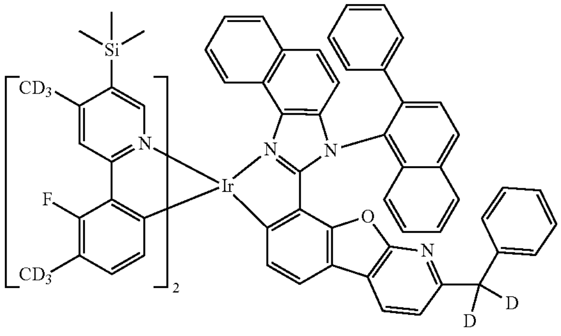
3154
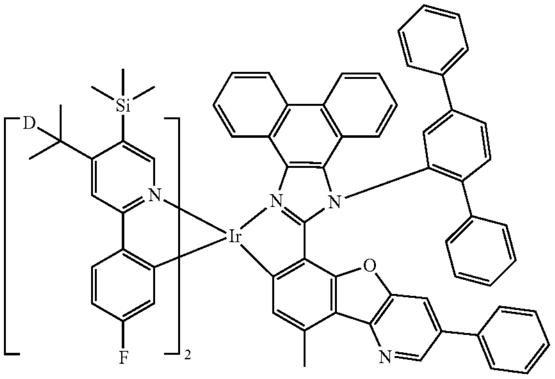

-continued
3155
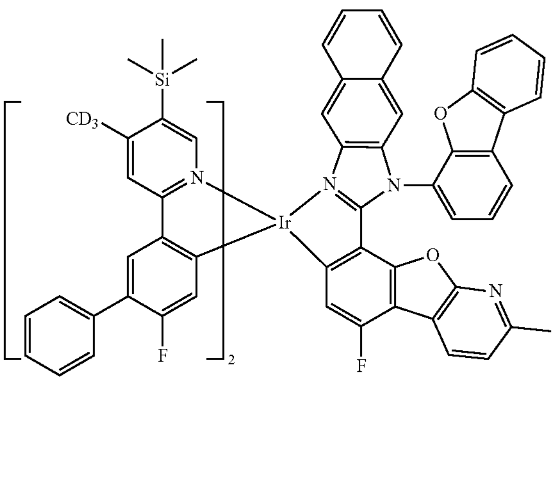
3156
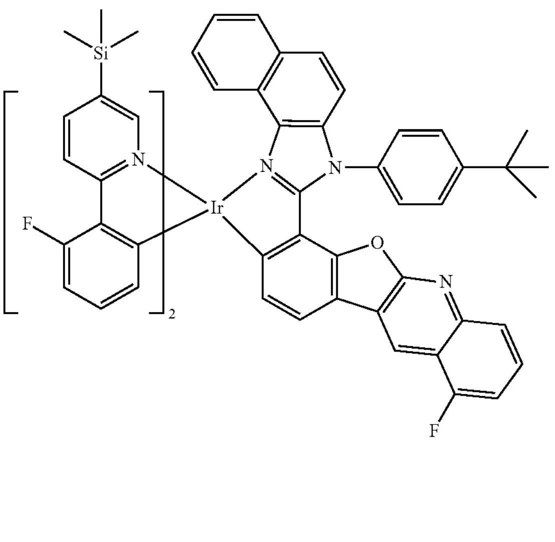
3157
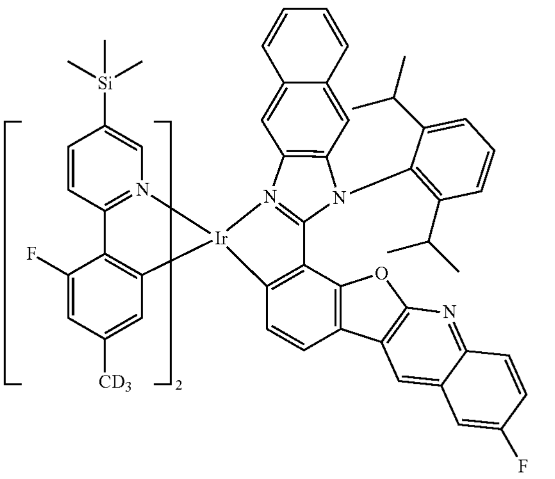
3158
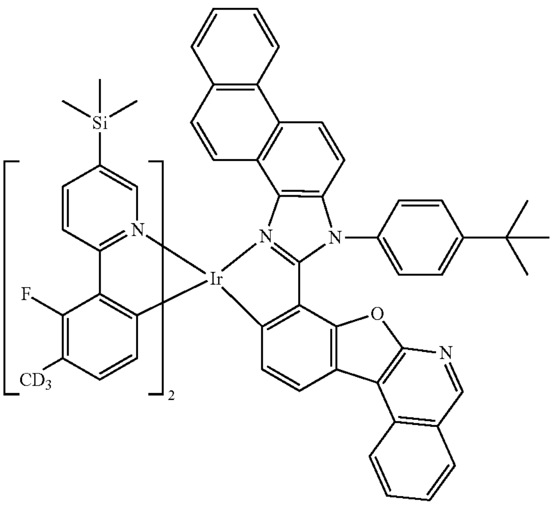
3159
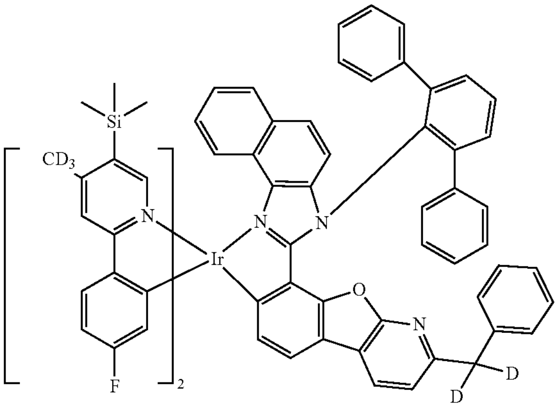
3160
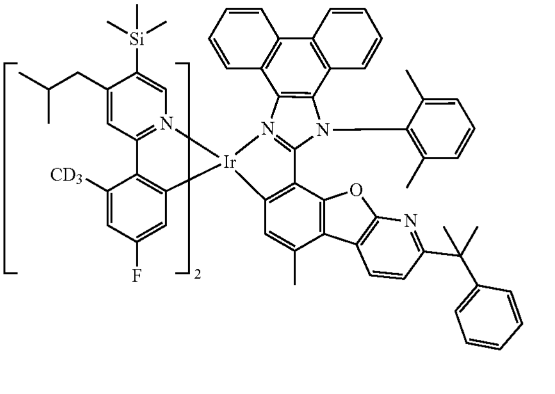

-continued
3161
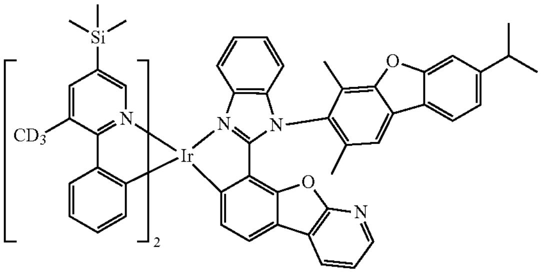
3162
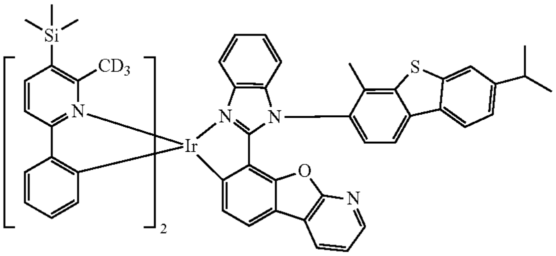
3163
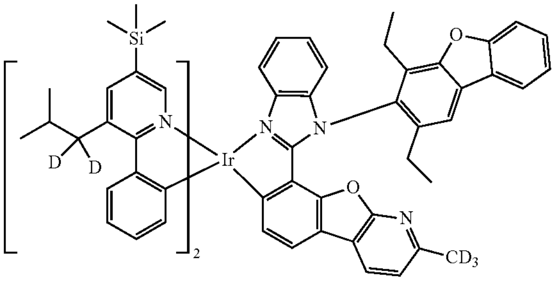
3164
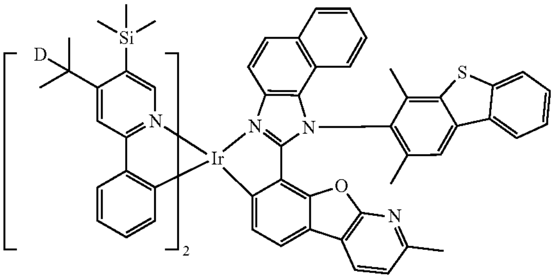
3165
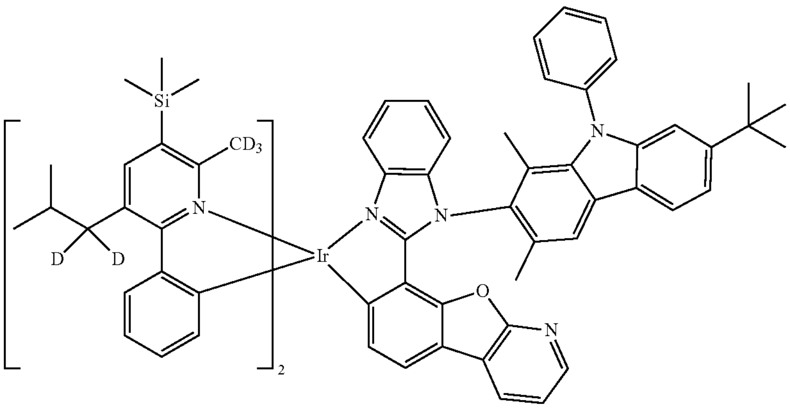
3166
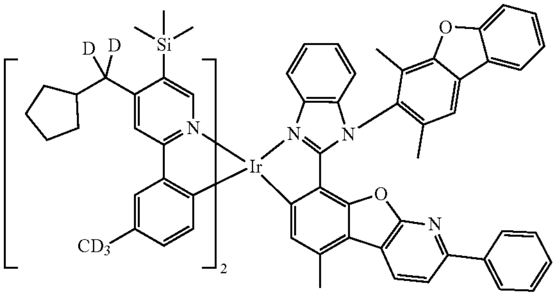
3167
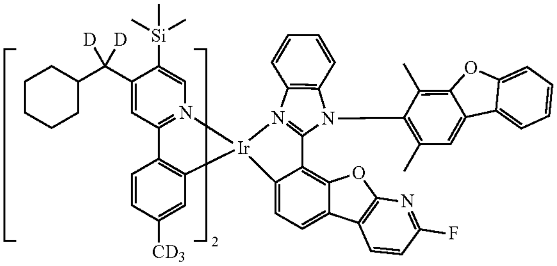

-continued
3168
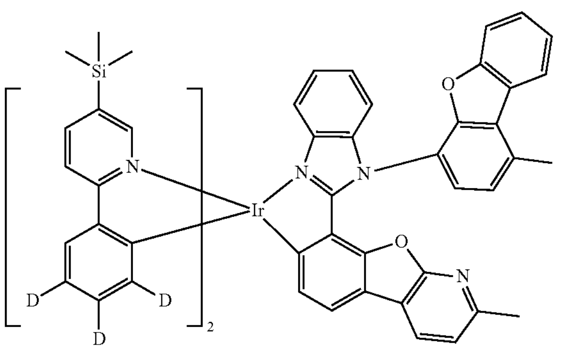
3169
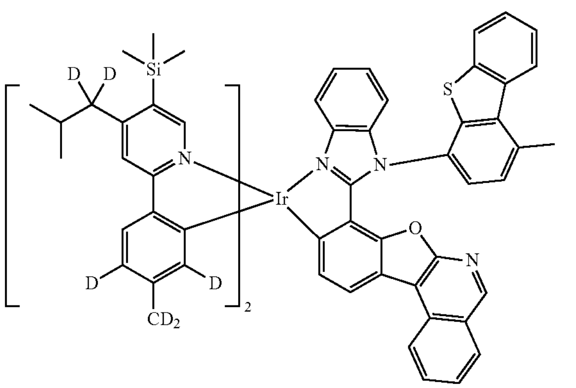
3170
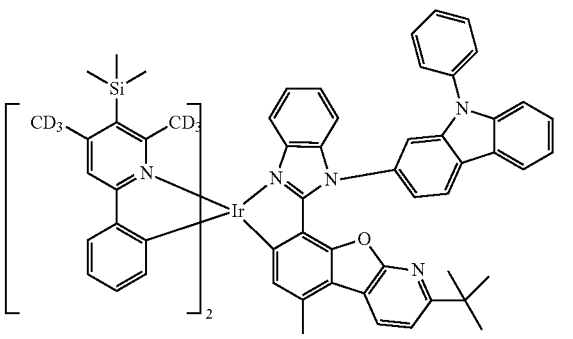
3171
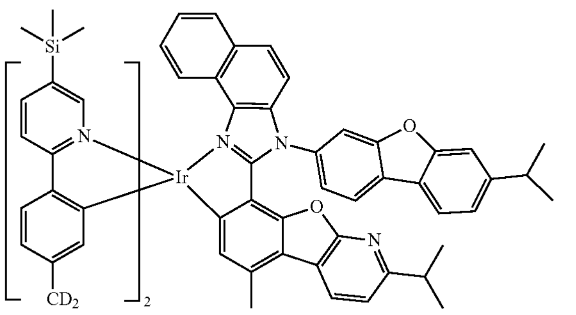
3172
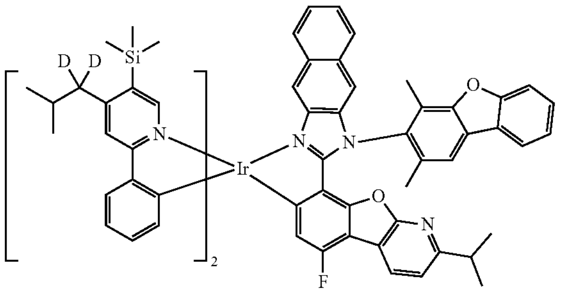
3173
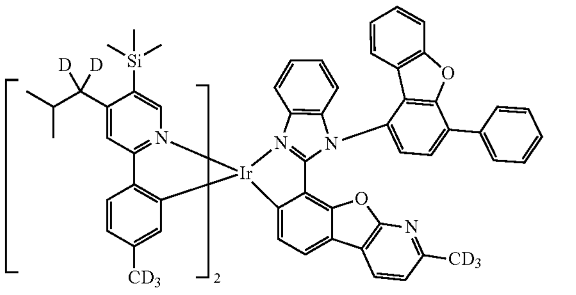
3174
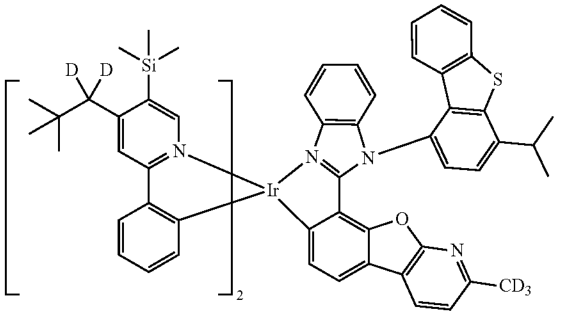
3175
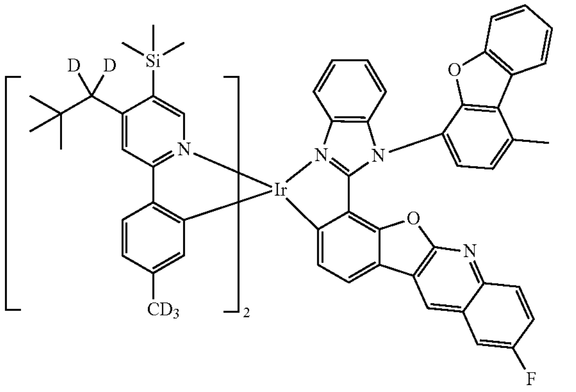

-continued
3176
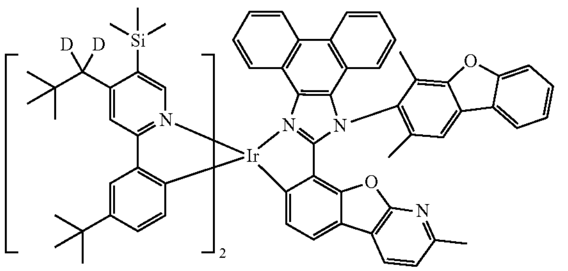
3177
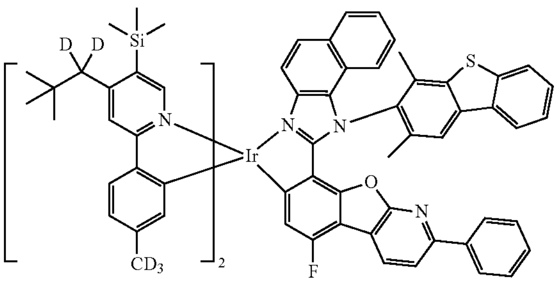
3178
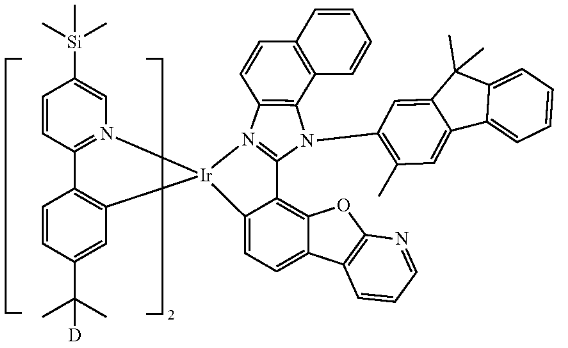
3179
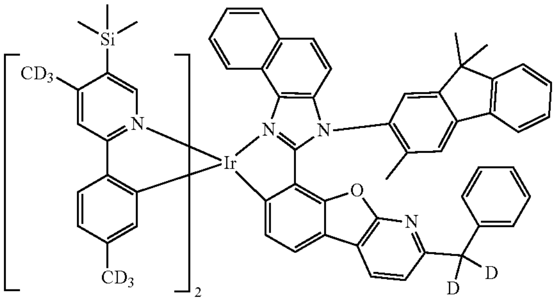
3180
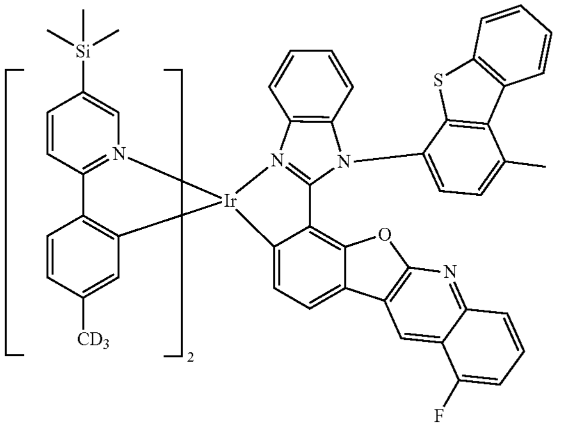
3181
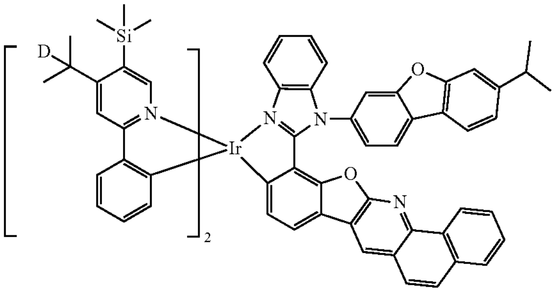
3182
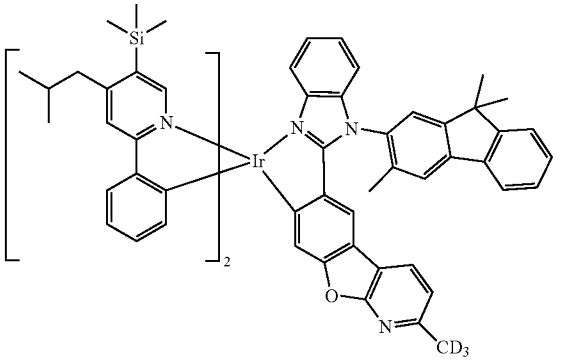
3183
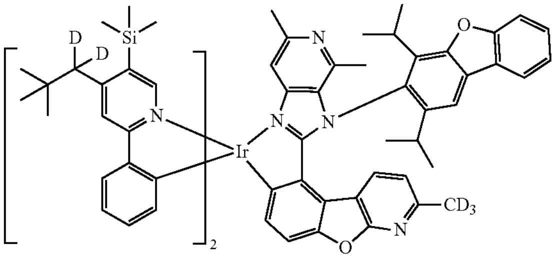

-continued
3184
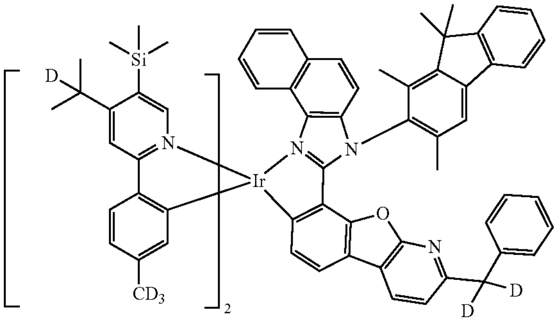
3185
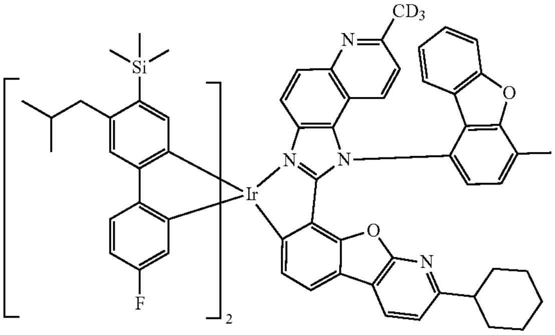
3186
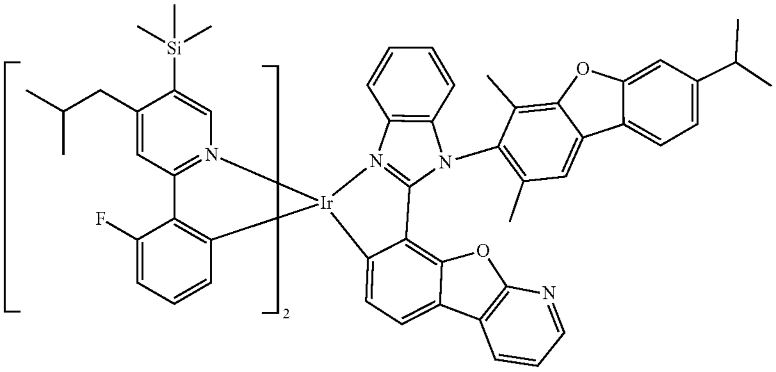
3187
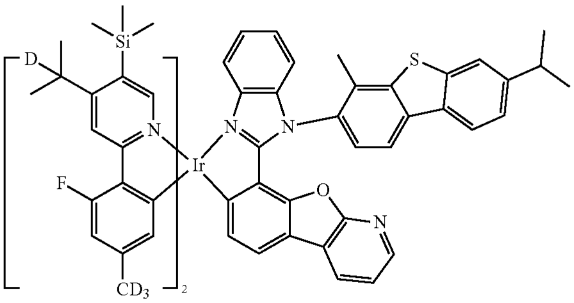
3188
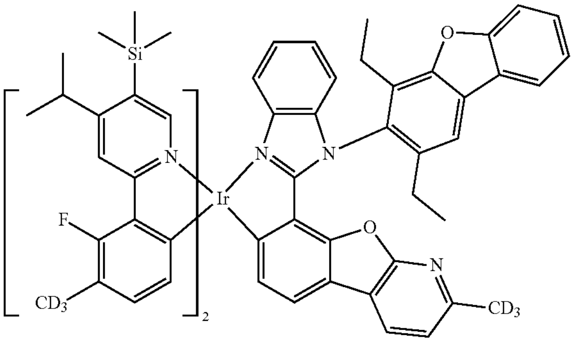
-continued
3189
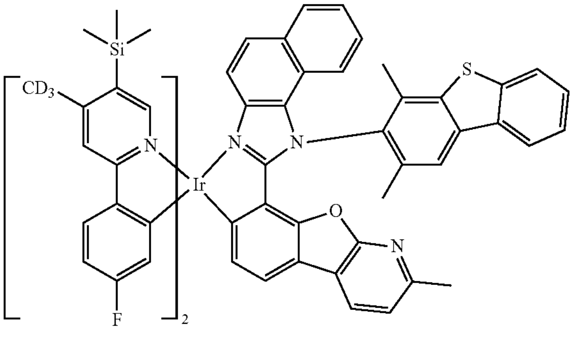
3190
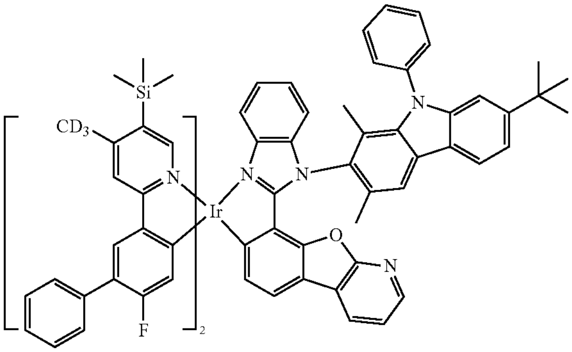

-continued
3191
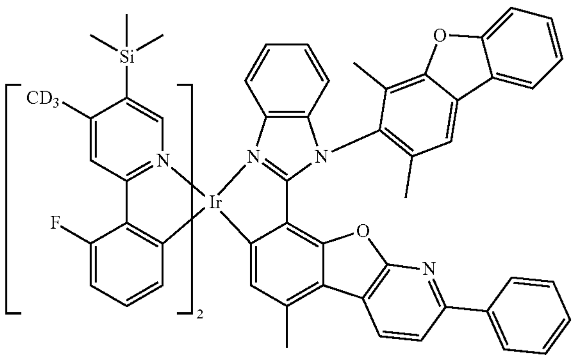
3192
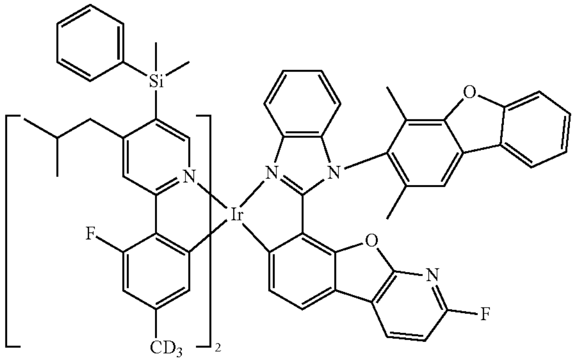
3193
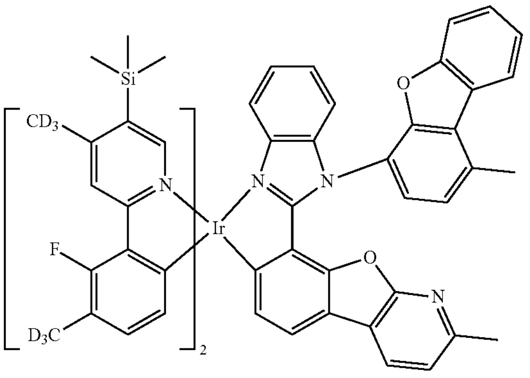
3194
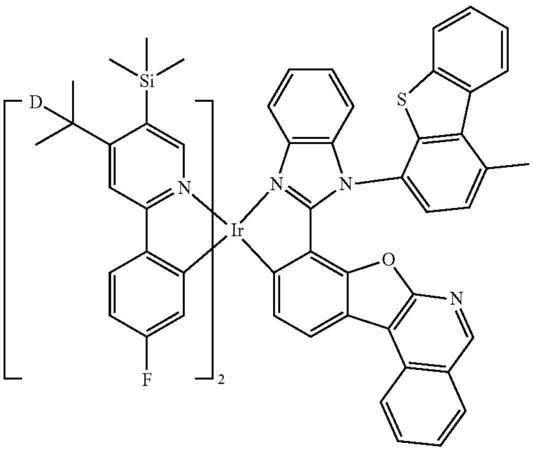
-continued
3195
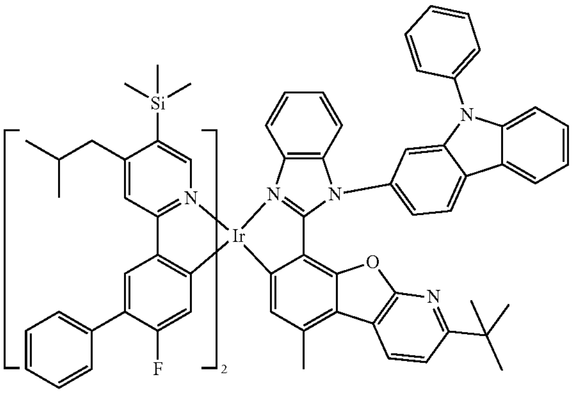
3196
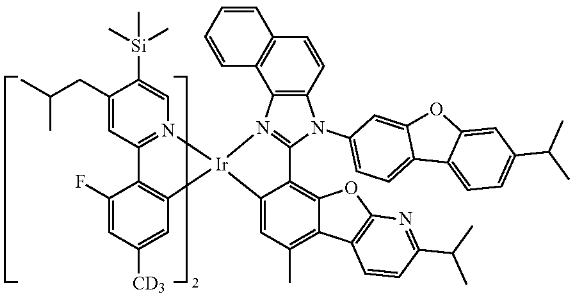
3197
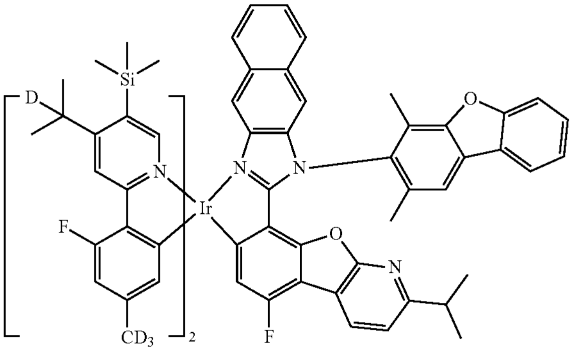
3198
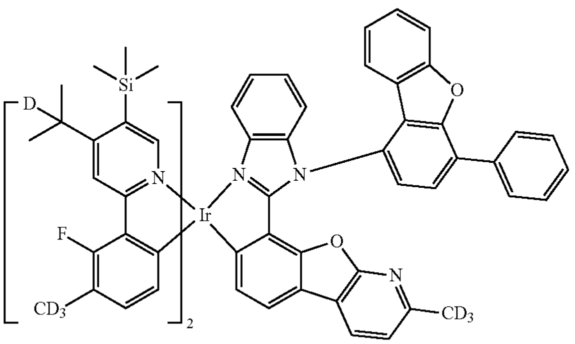

-continued
3199
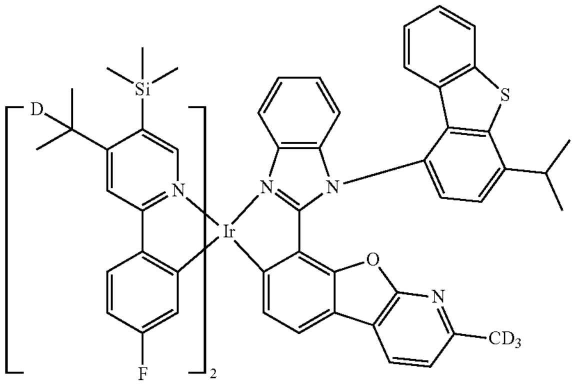
3200
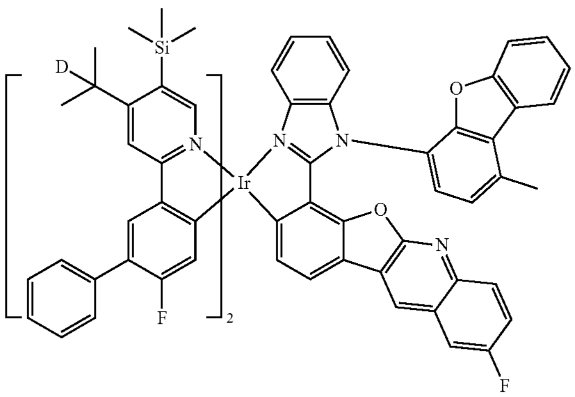
3201
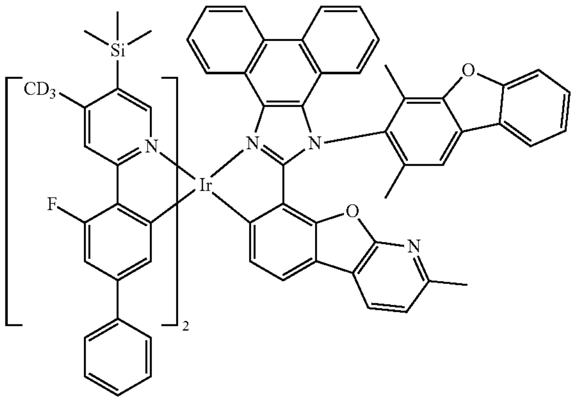
3202
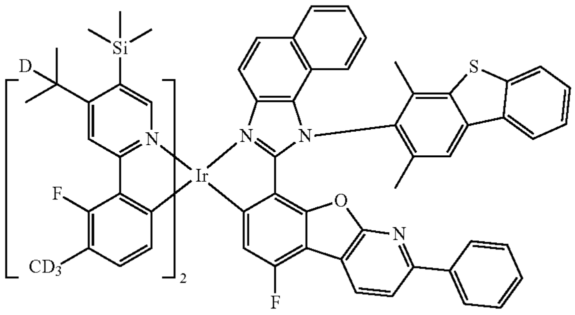
-continued
3203
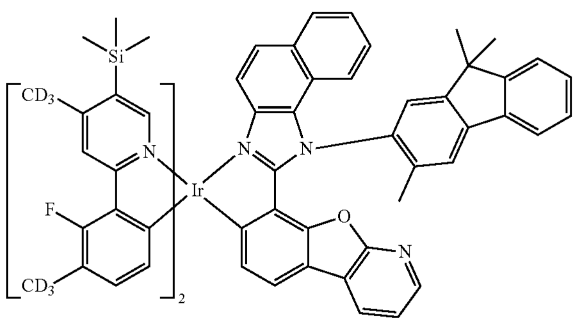
3204
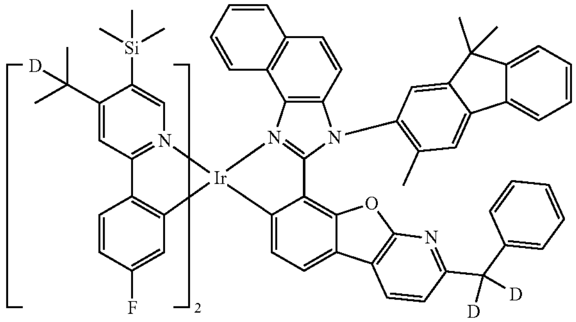
3205
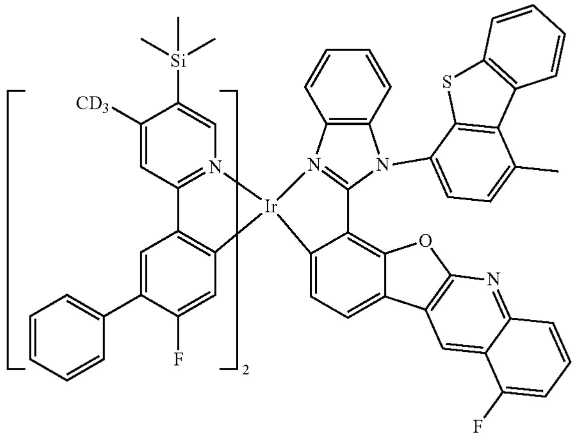
3206
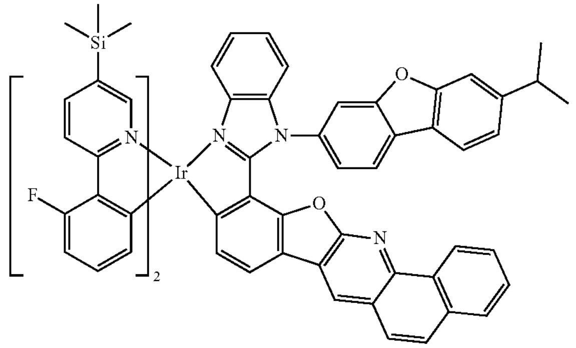

-continued
3207
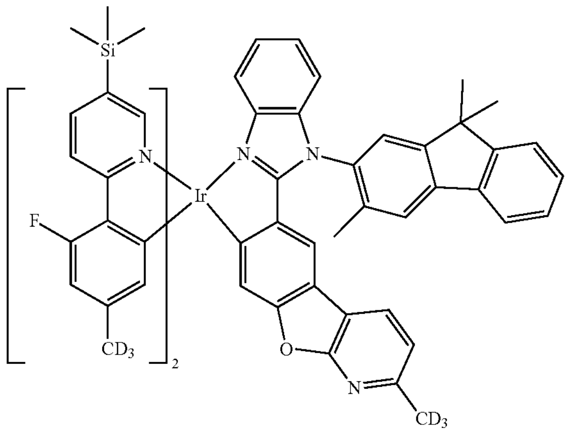
3208
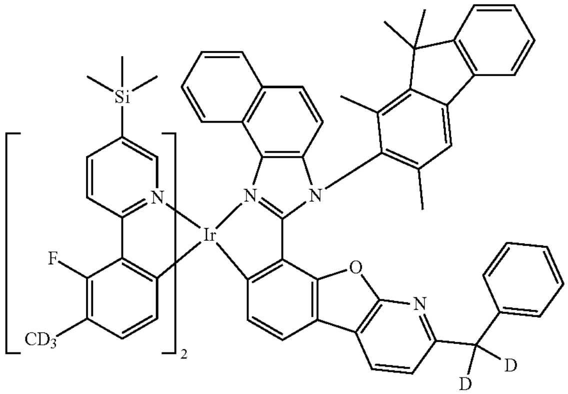
3209
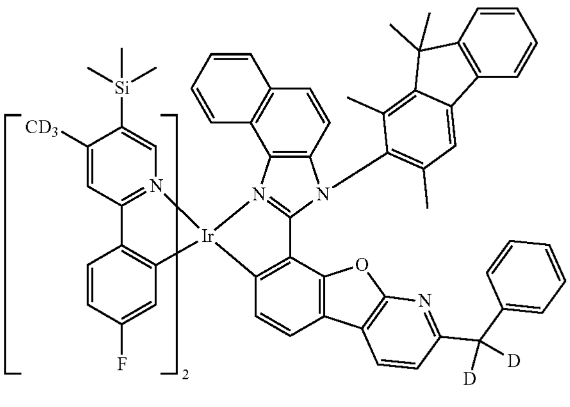
-continued
3210
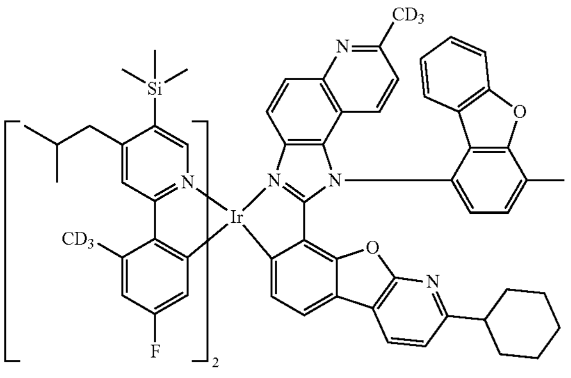
3211
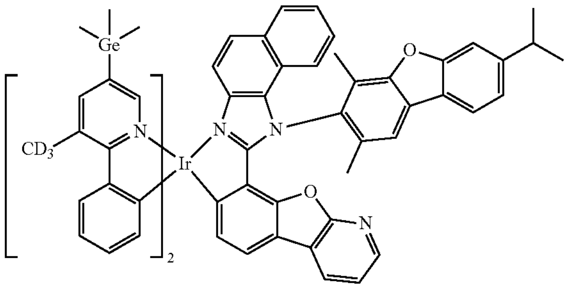
3212
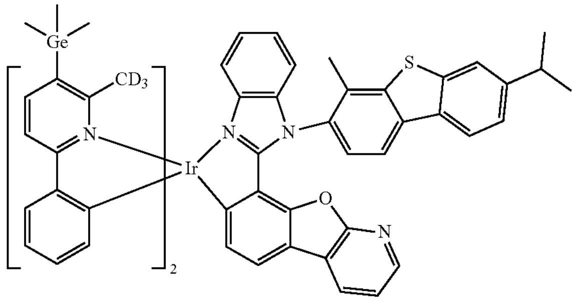
3213
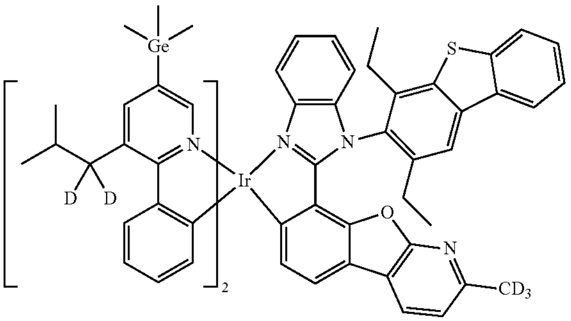

-continued
3214
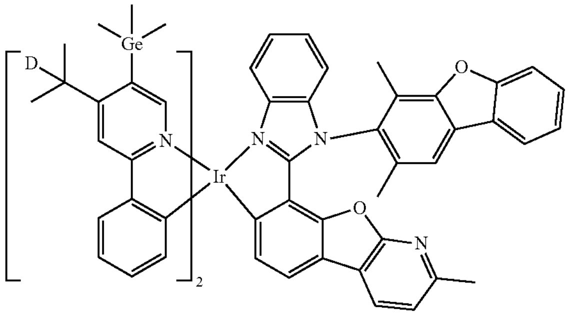
3215
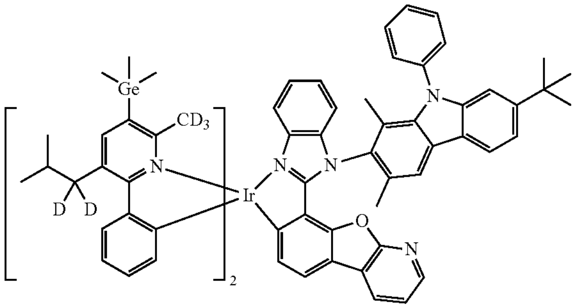
3216
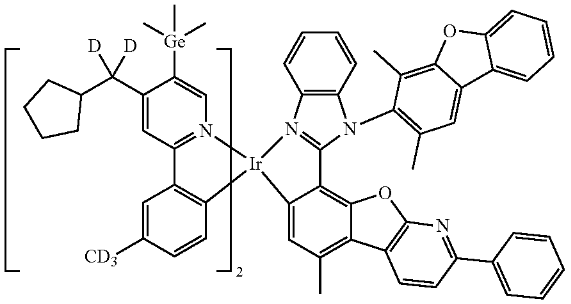
3217
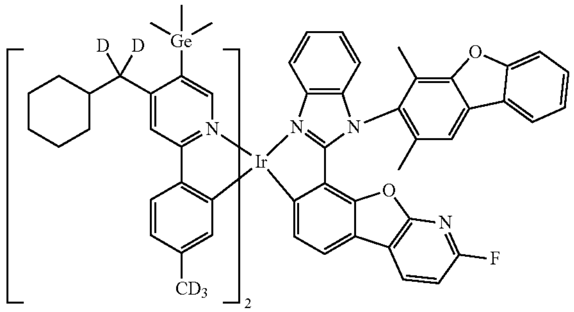
-continued
3218
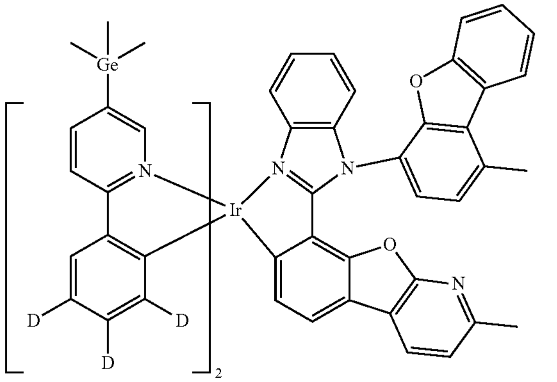
3219
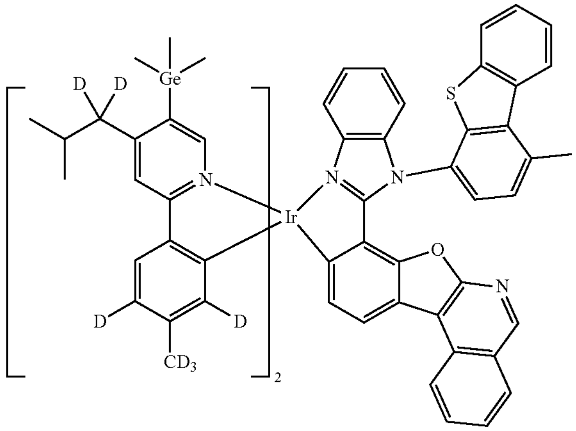
3220
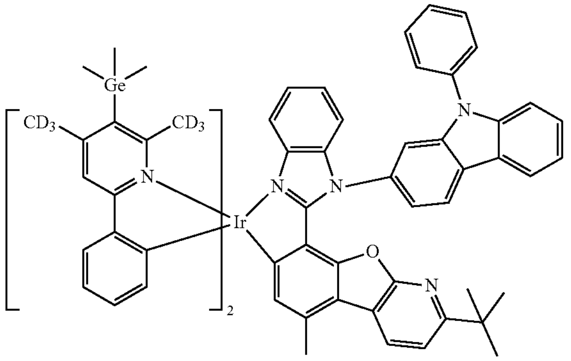
3221
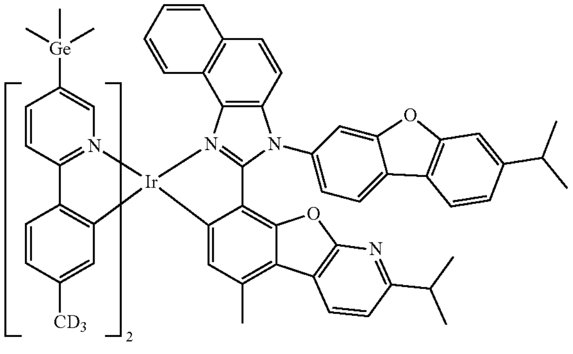

-continued
3222
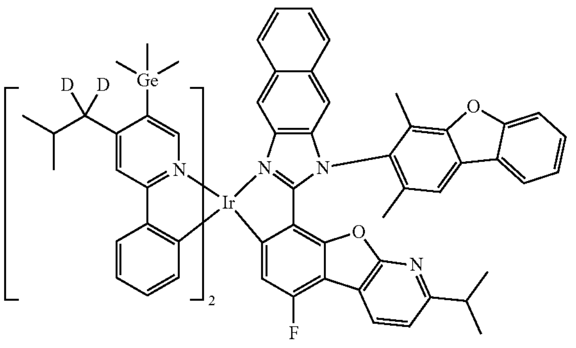
3223
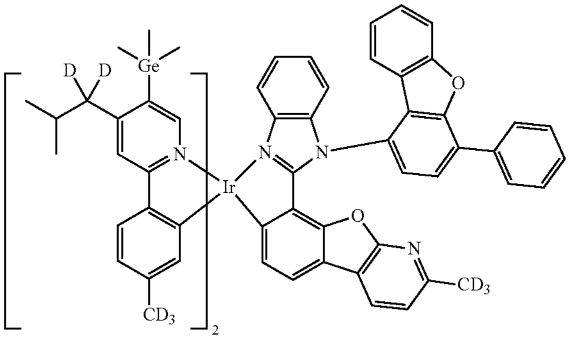
3224
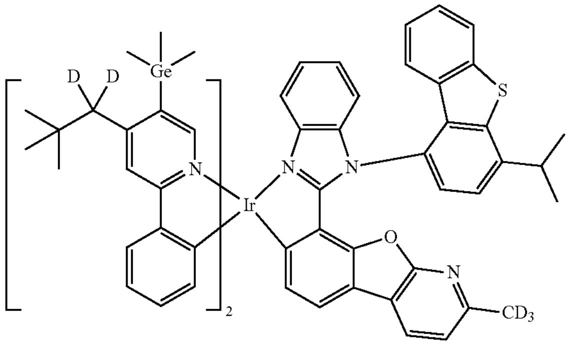
3225
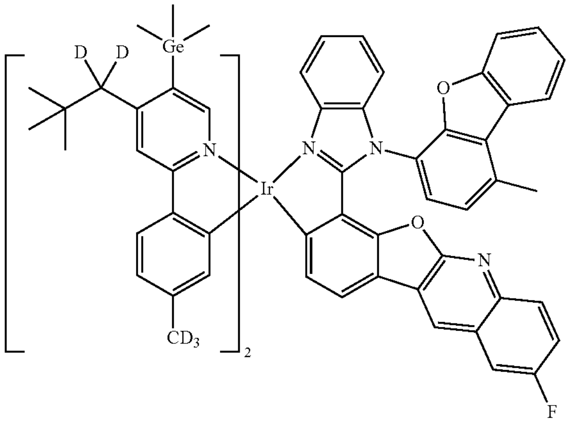
3226
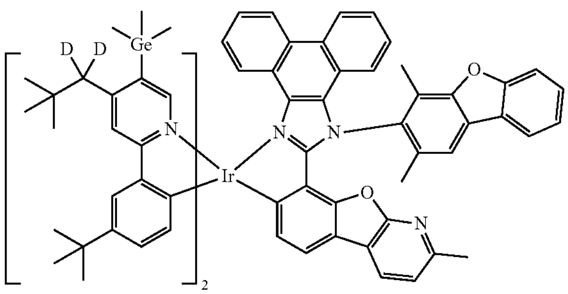
3227
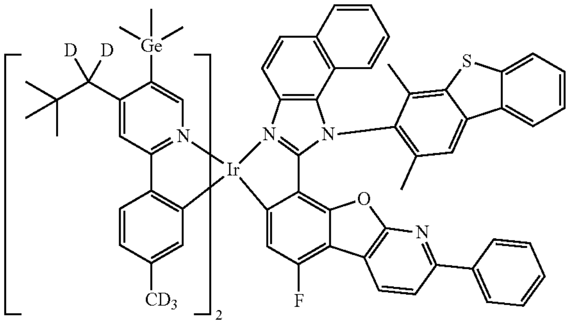
3228
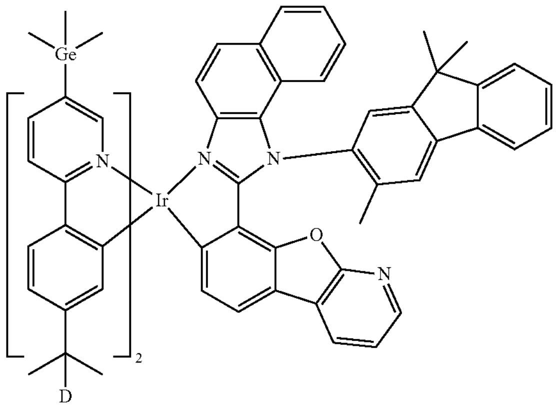
3229
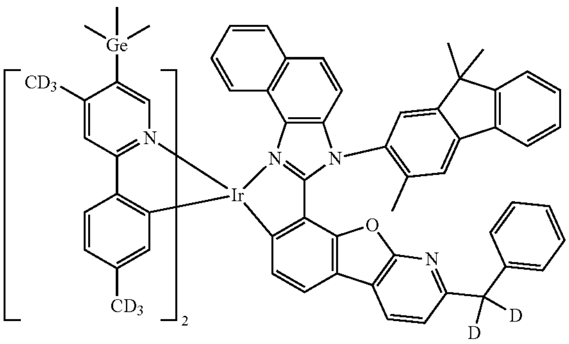

-continued
3230
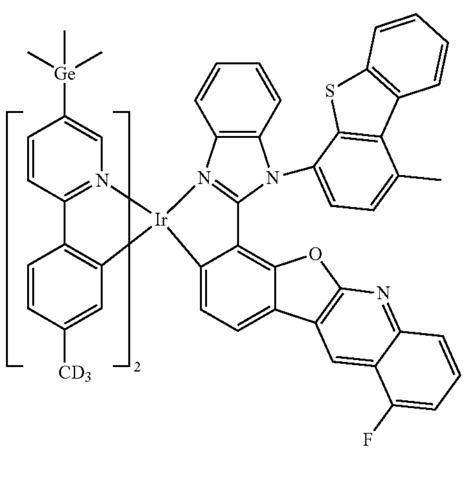
3231
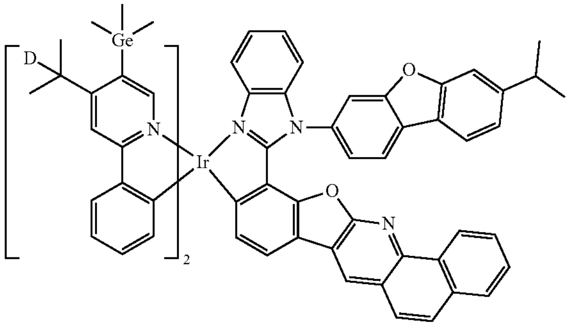
3232
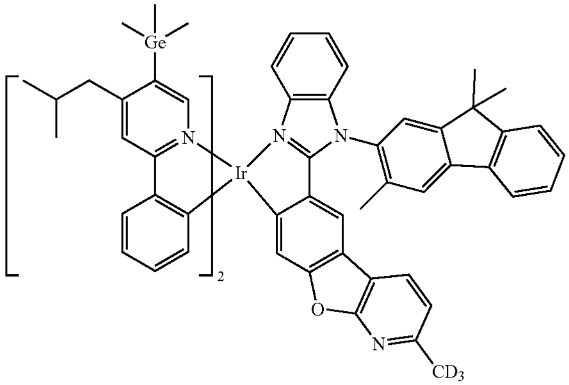
3233
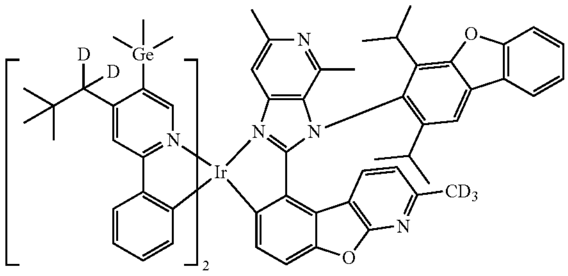
-continued
3234
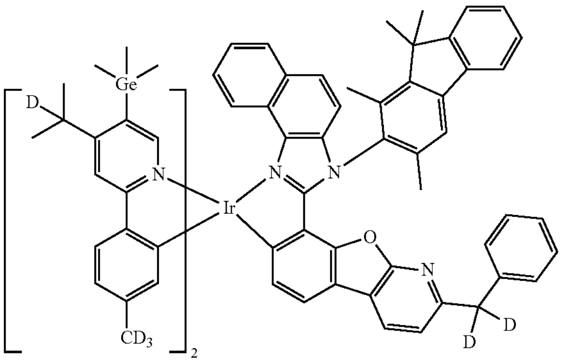
3235
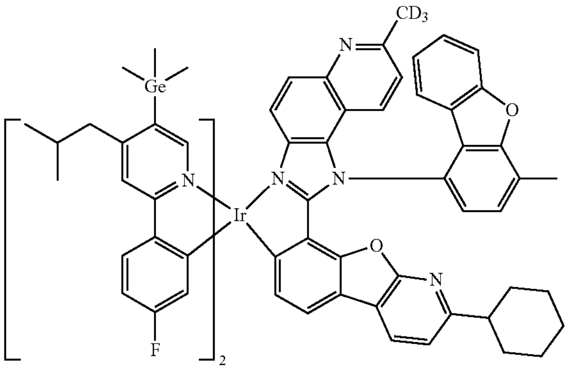
3236
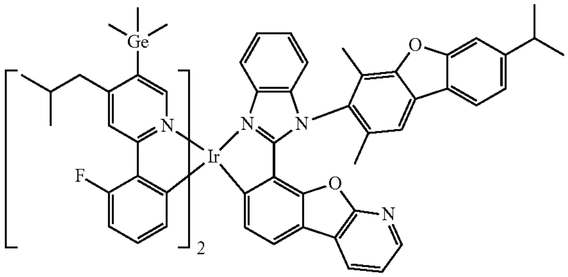
3237
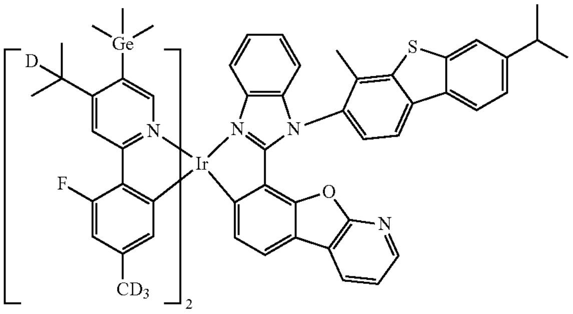

-continued
3238
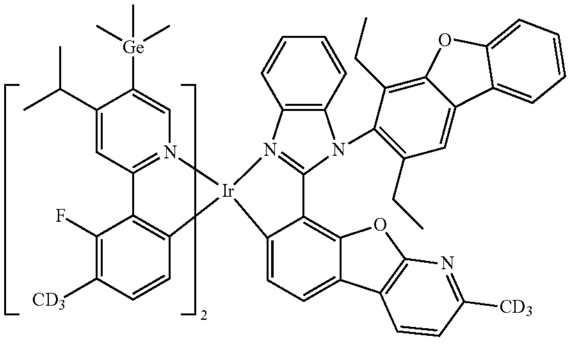
3239
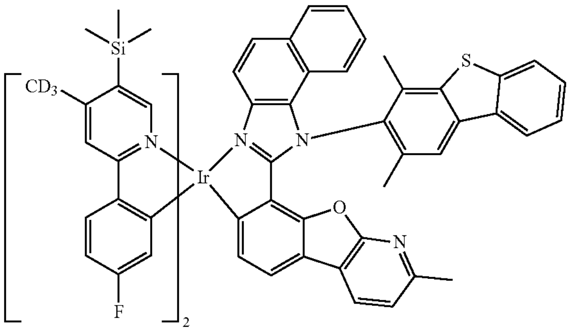
3240
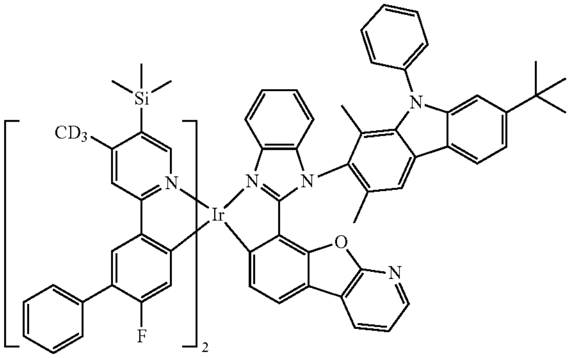
3241
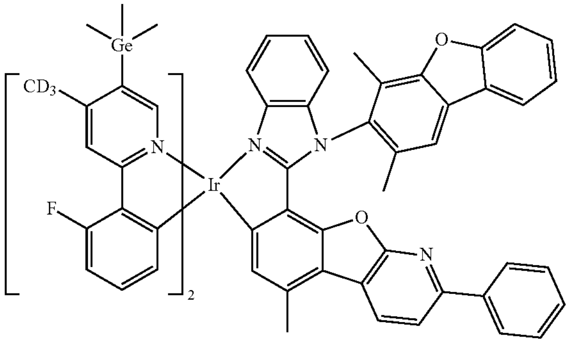
-continued
3242
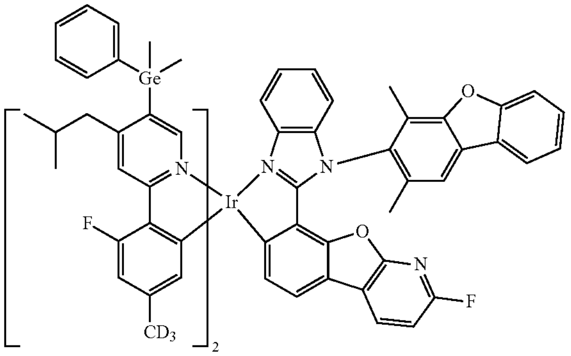
3243
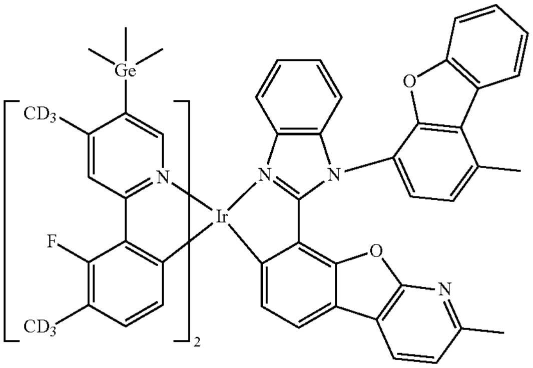
3244
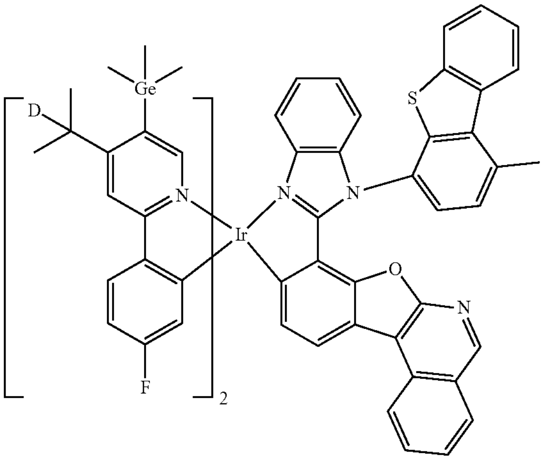

-continued
3245
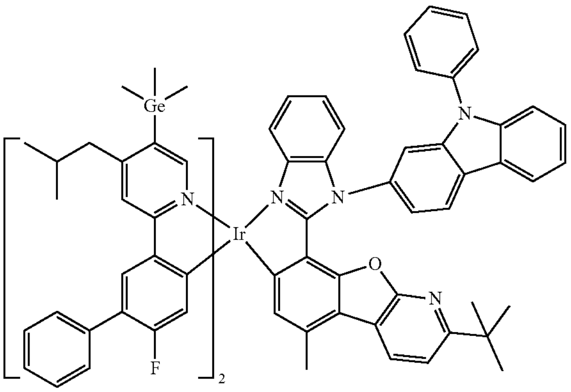
3246
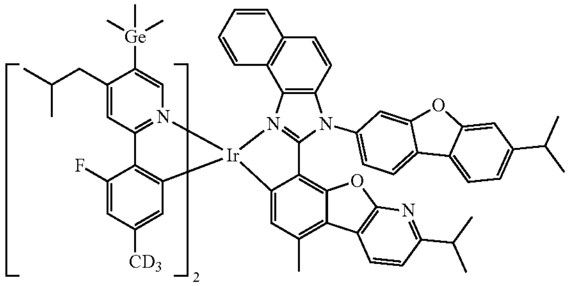
3247
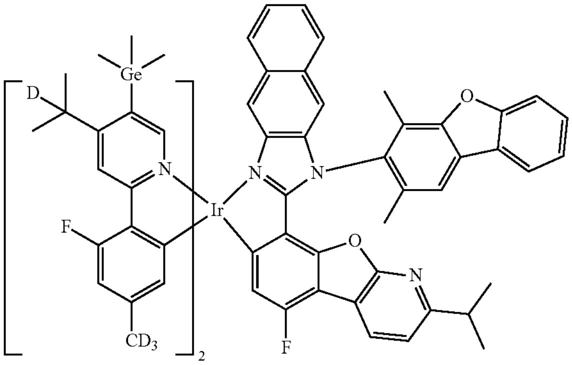
3248
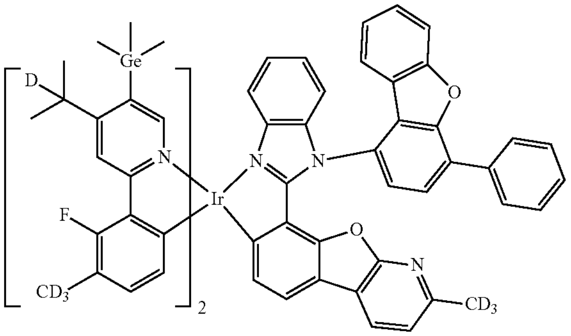
-continued
3249
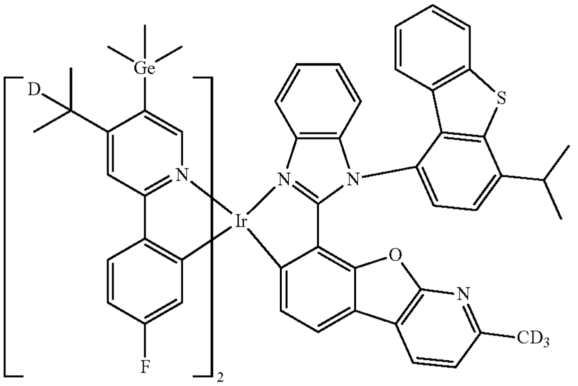
3250
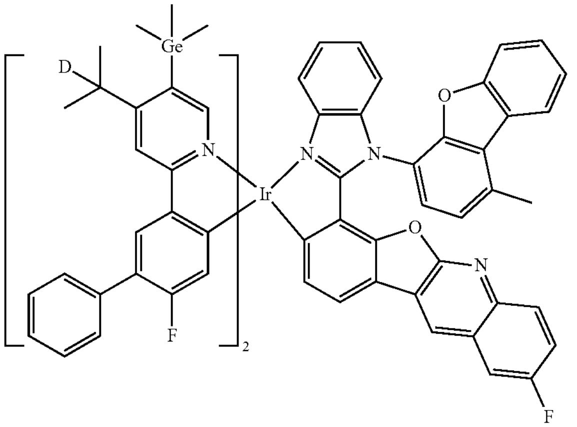
3251
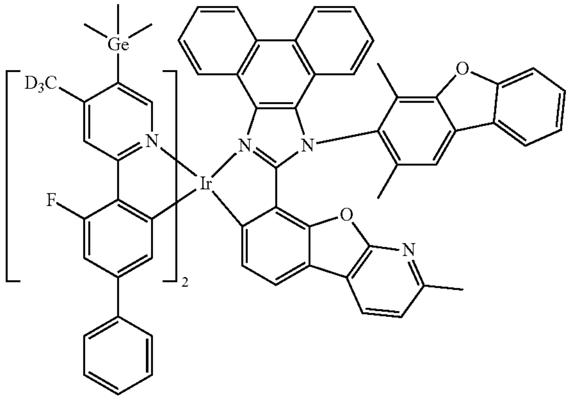
3252
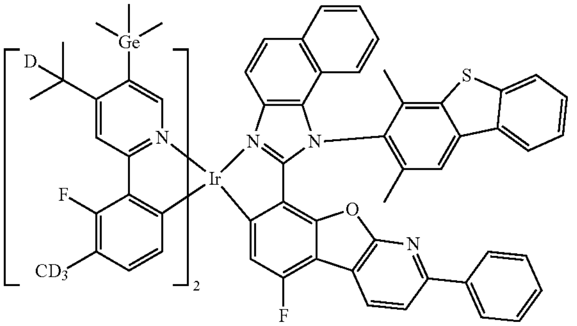

-continued
3253
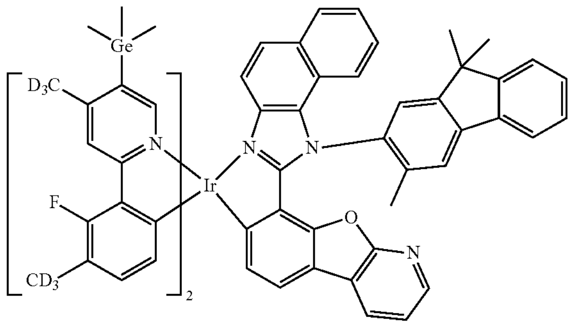
3254
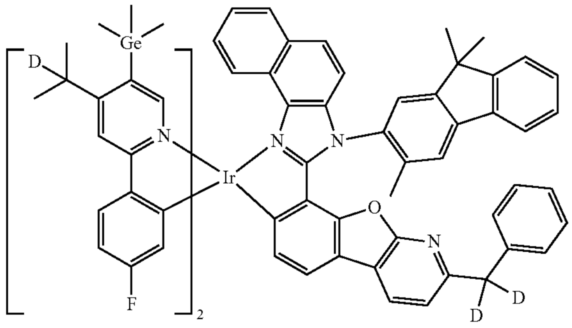
3255
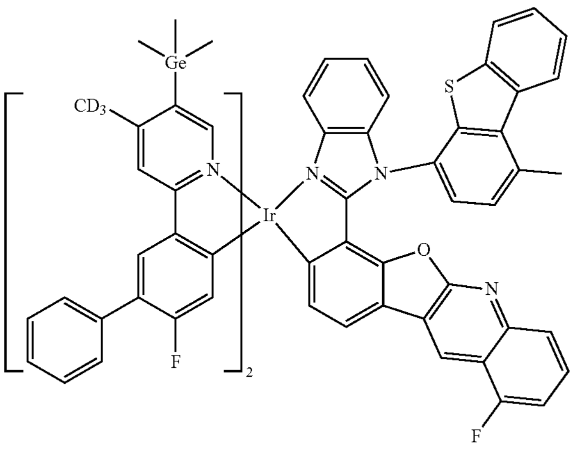
3256
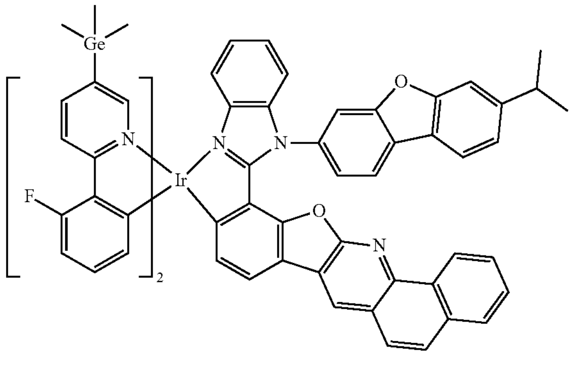
-continued
3257
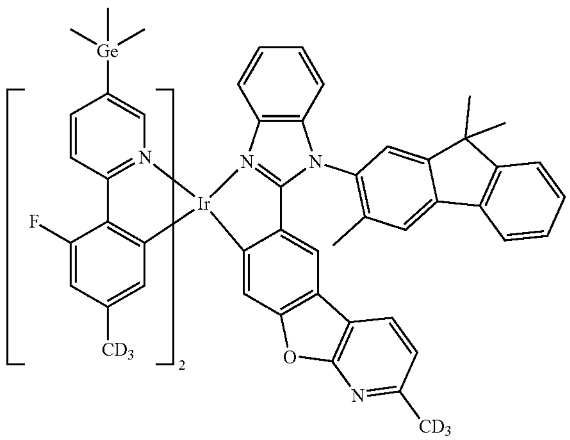
3258
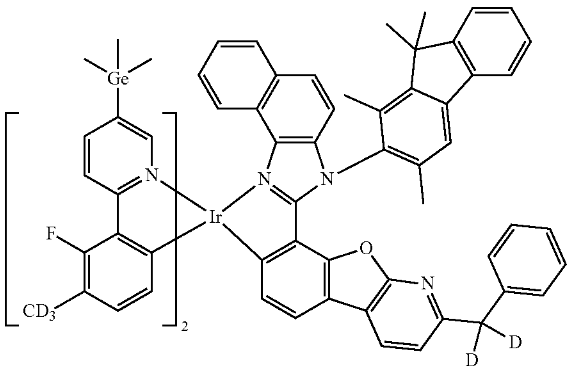
3259
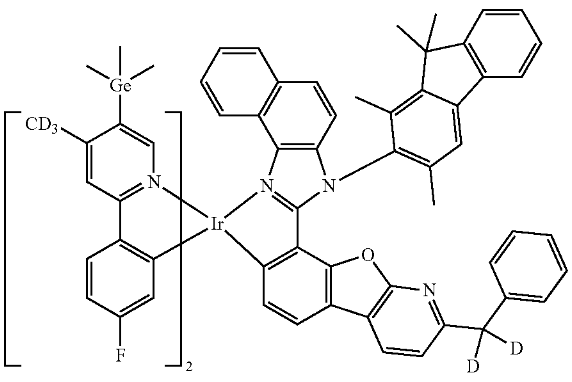
3260
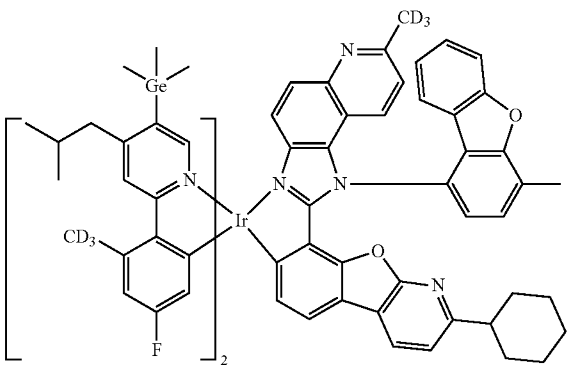

-continued
3261
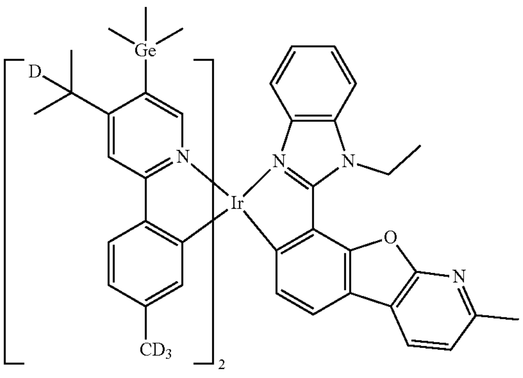
3262
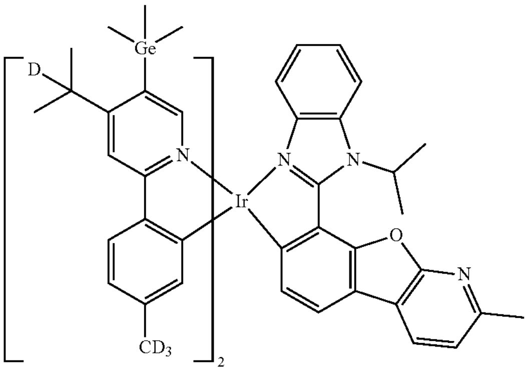
3263
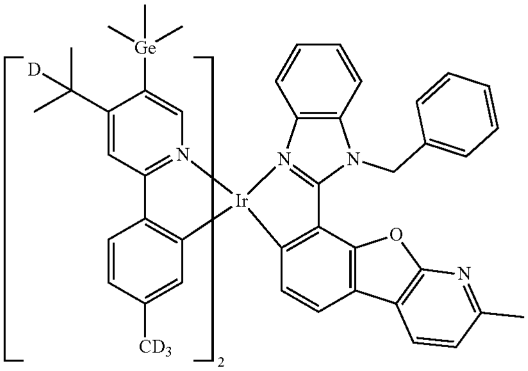
3264
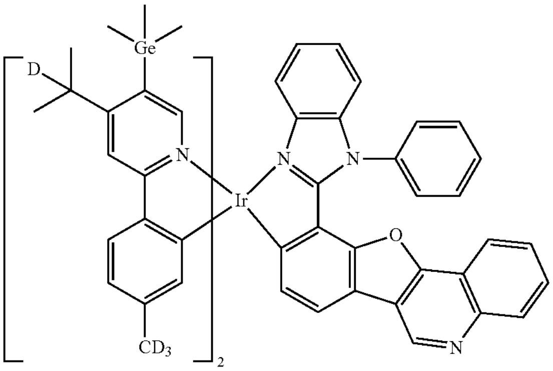
-continued
3265
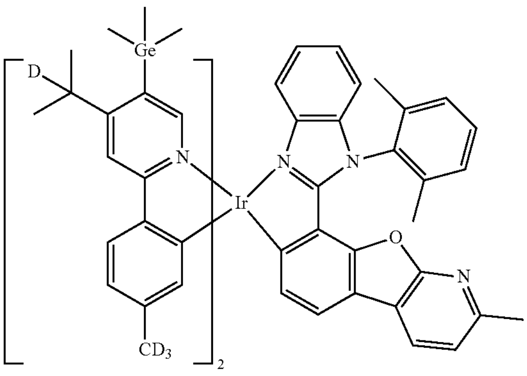
3266
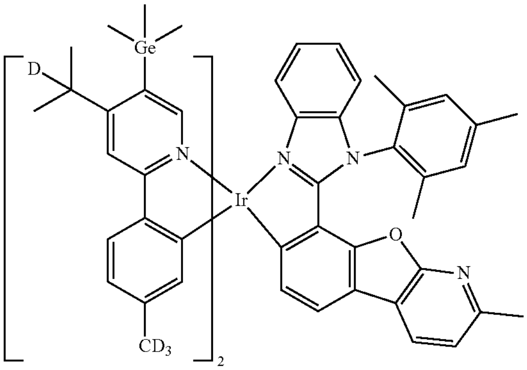
3267
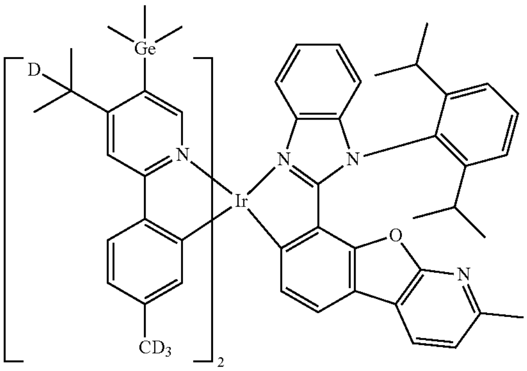
3268
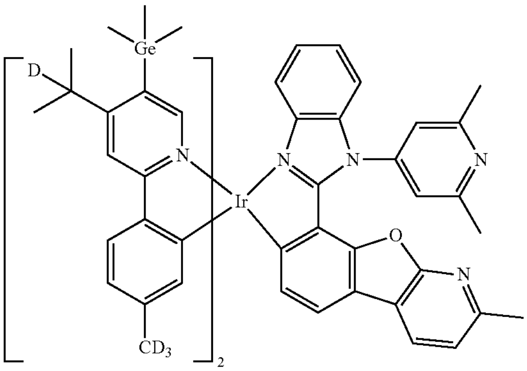

-continued
3269
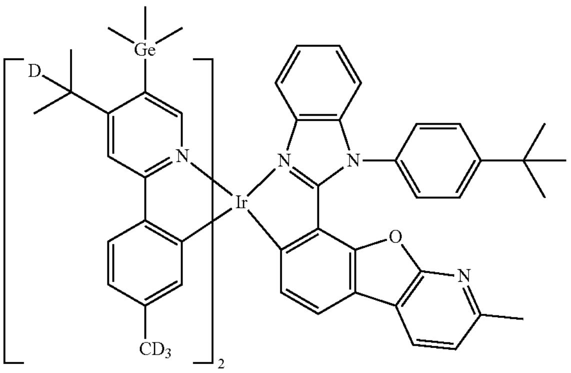
3270
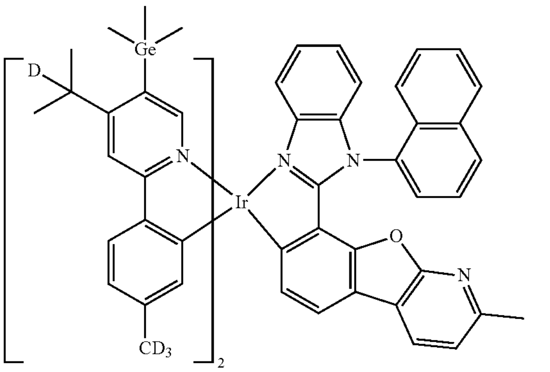
3271
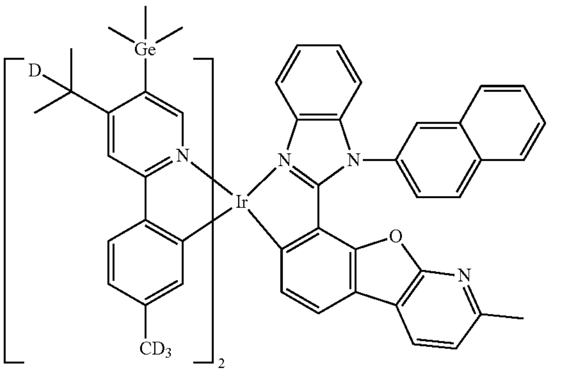
3272
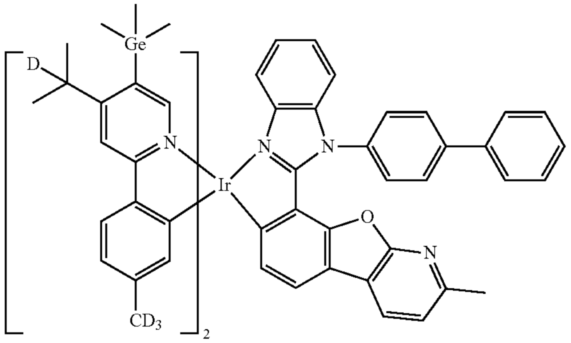
-continued
3273
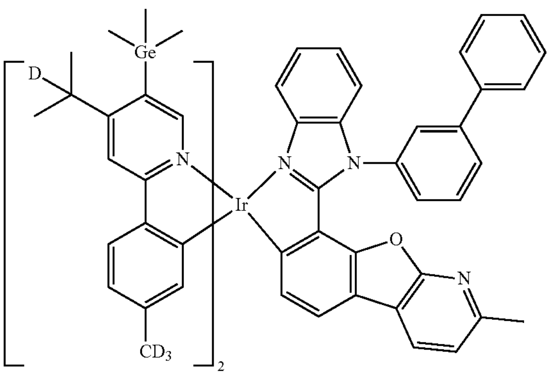
3274
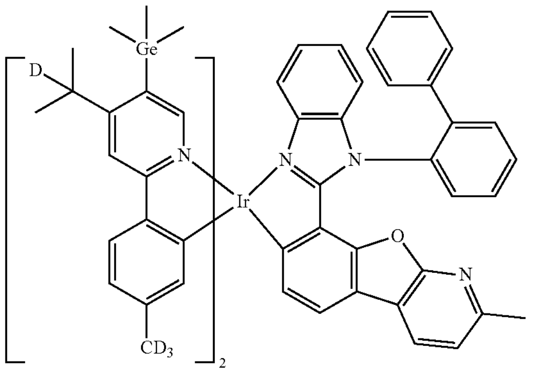
3275
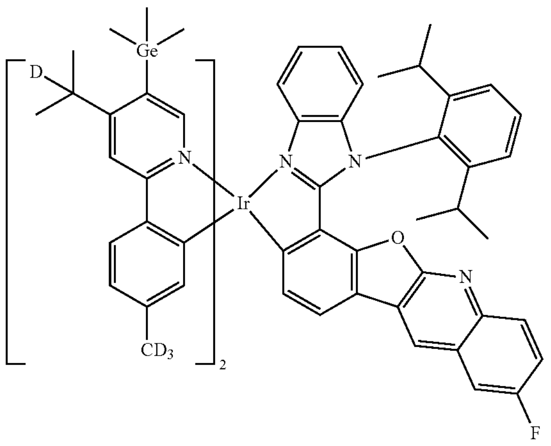
3276
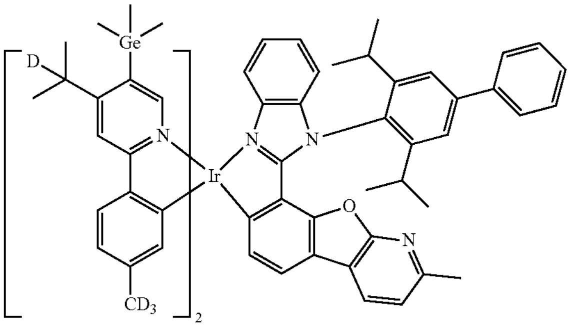

-continued
3277
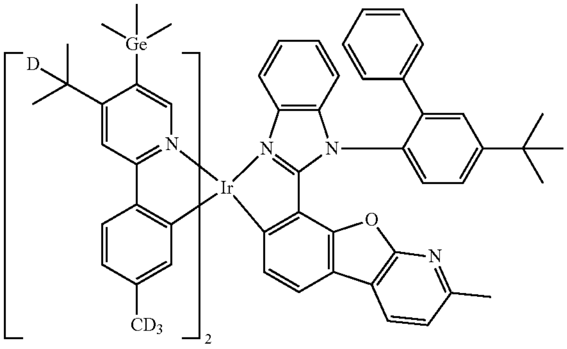
3278
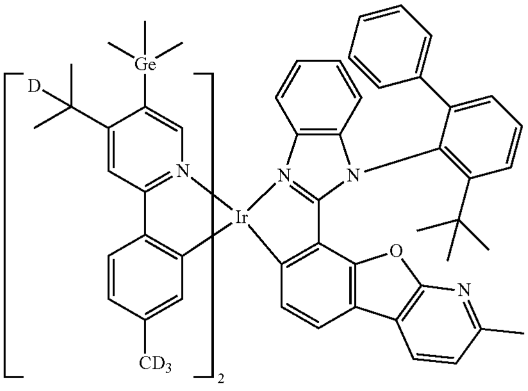
3279
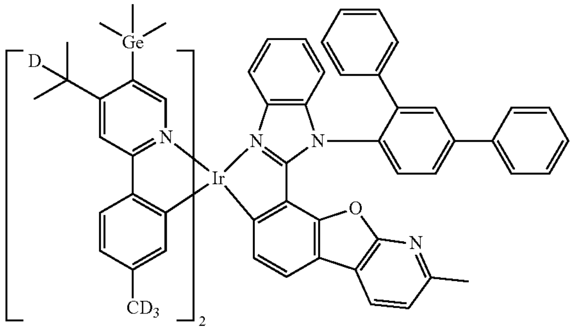
3280
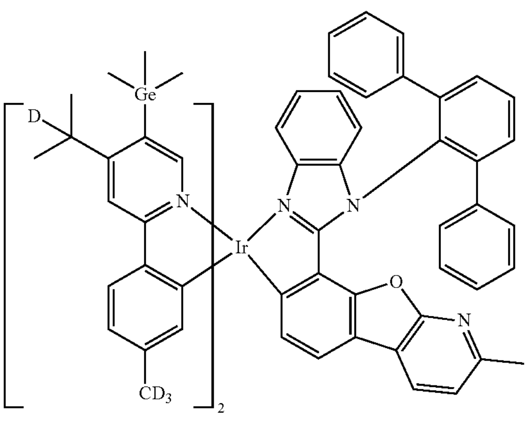
-continued
3281
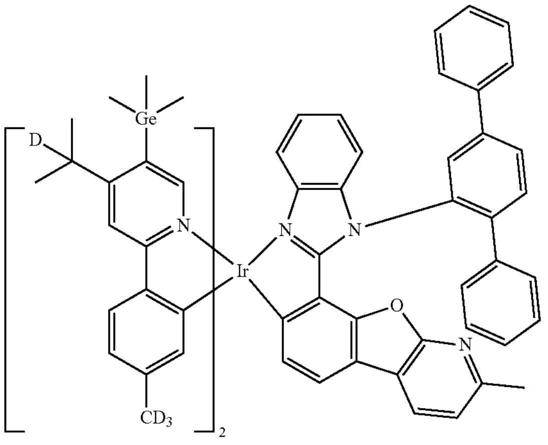
3282
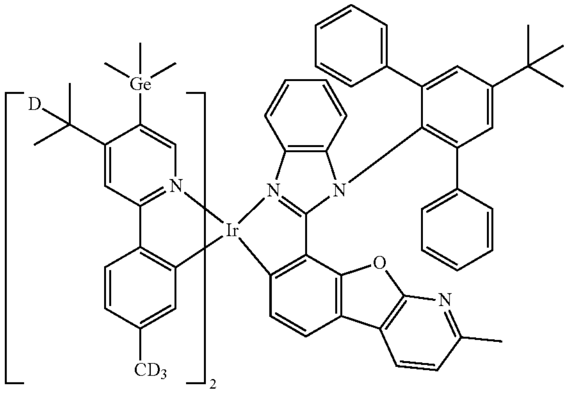
3283
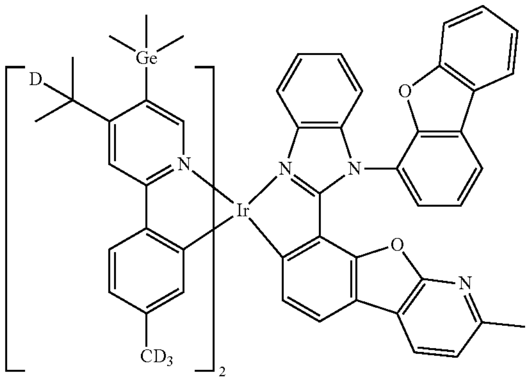

-continued
3284
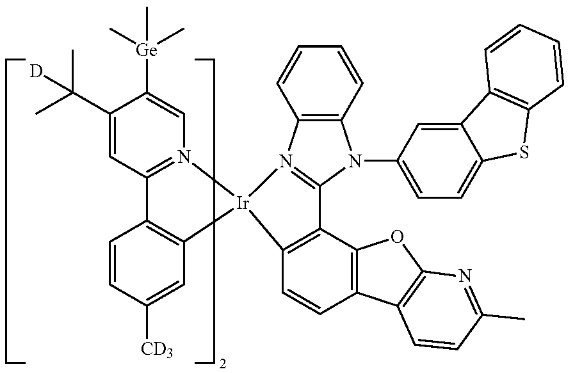
3285
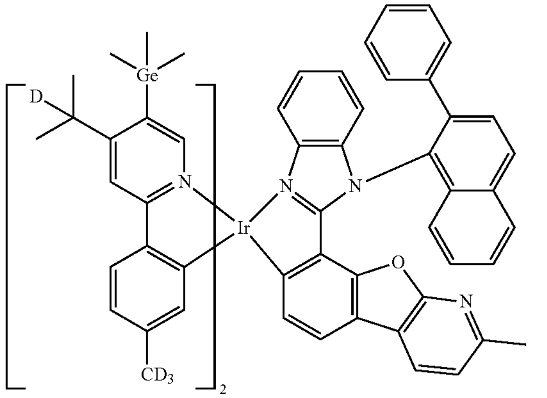
3286
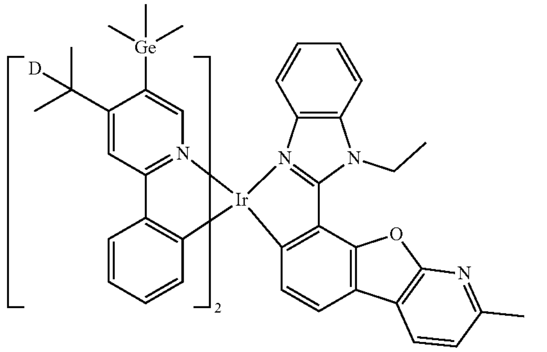
3287
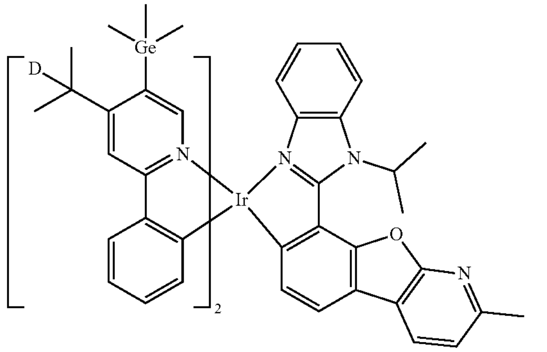
-continued
3288
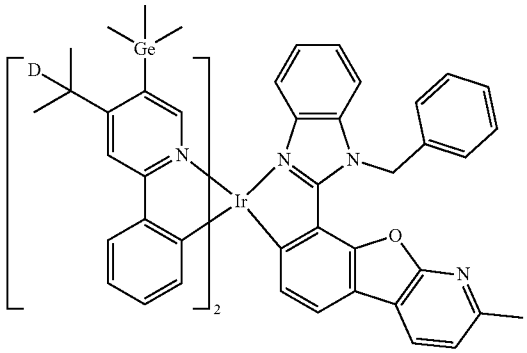
3289
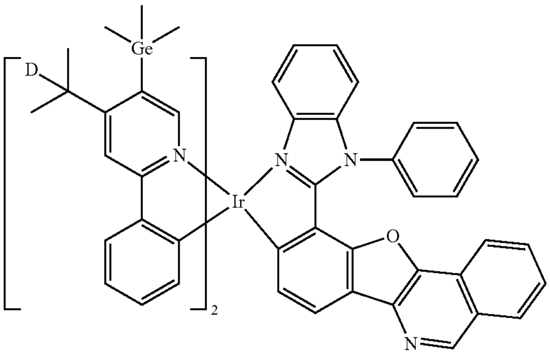
3290
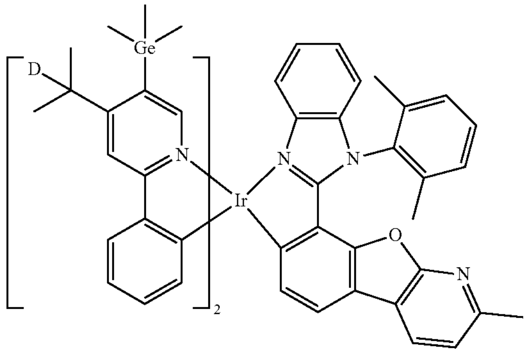
3291
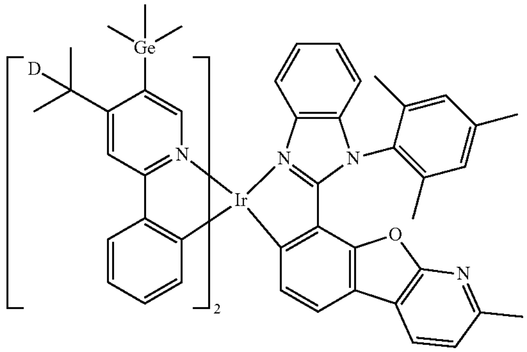

3292
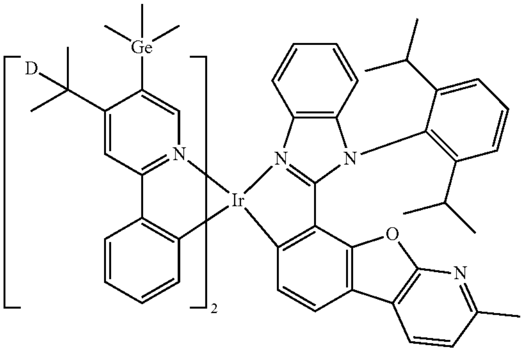
3293
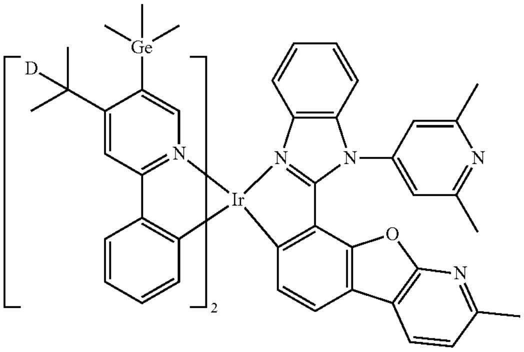
3294
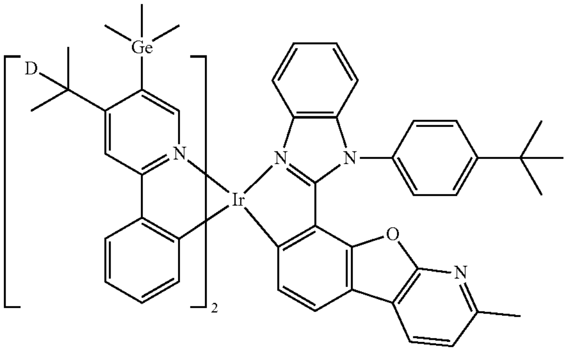
3295
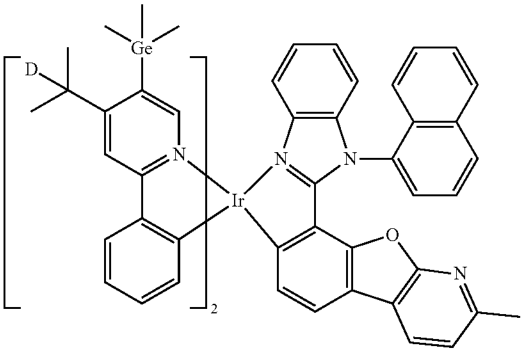
3296
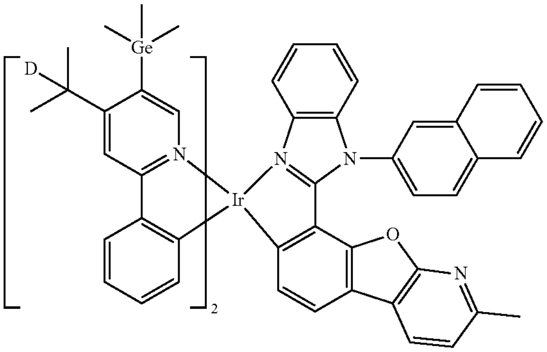
3297
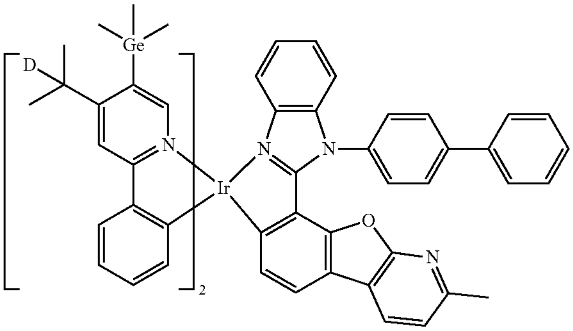
3298
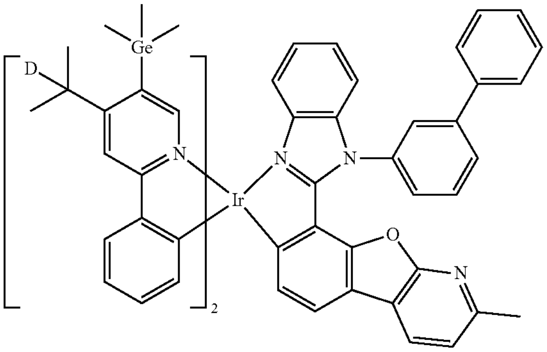
3299
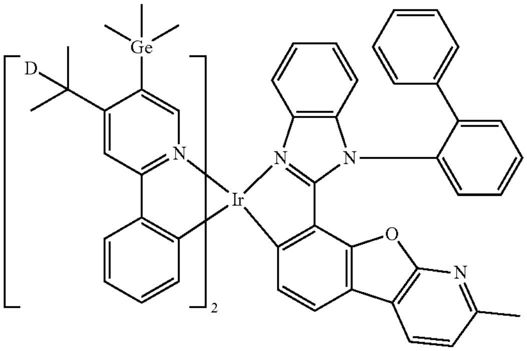

-continued
3300
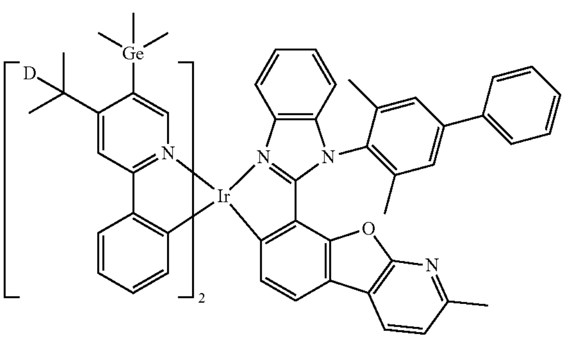
3301
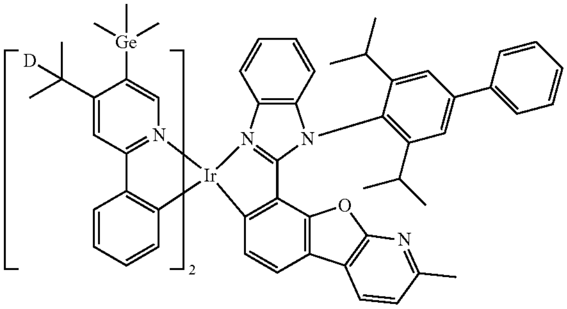
3302
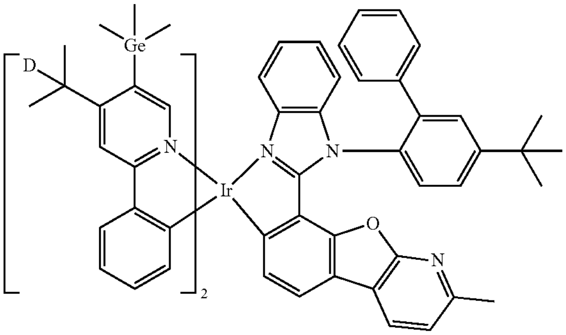
3303
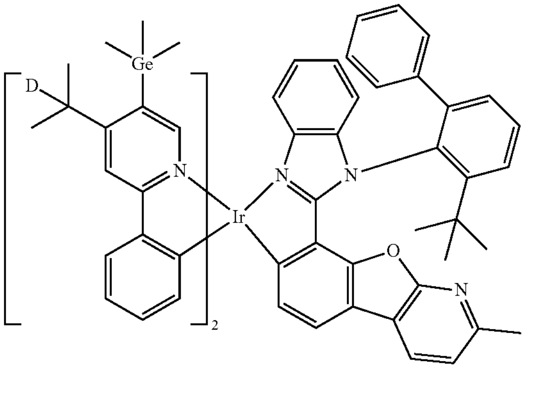
3304
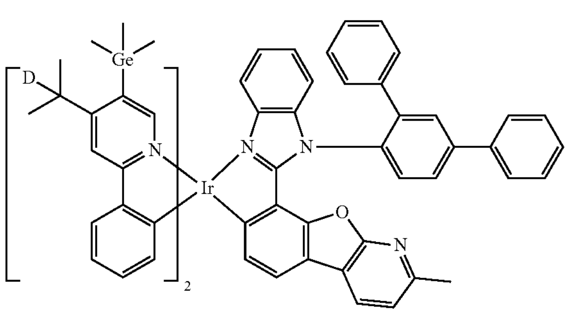
3305
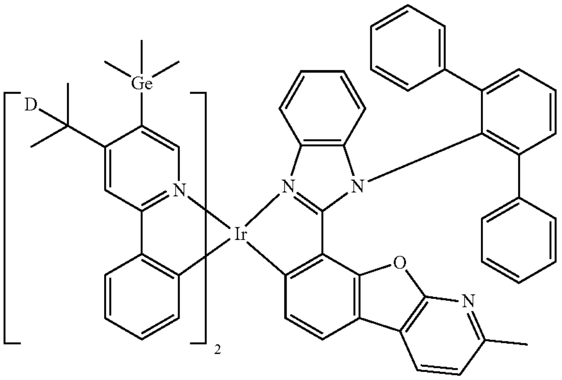
3306
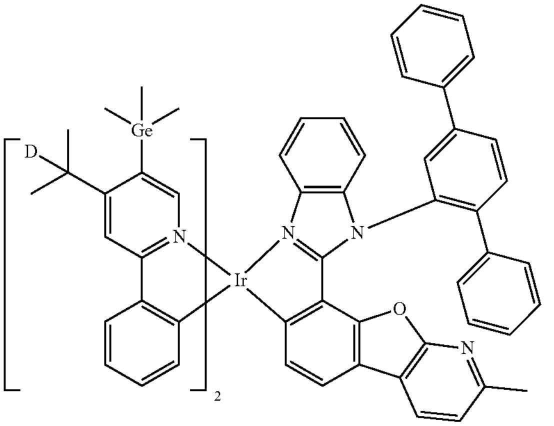
3307
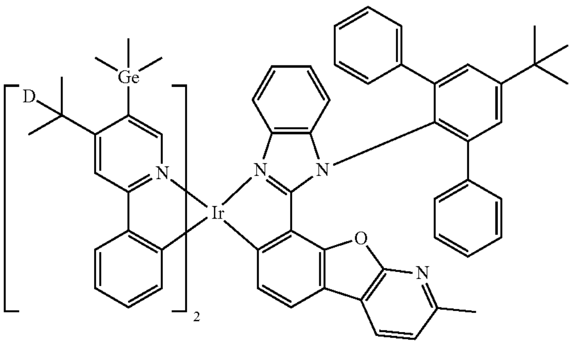

-continued
3308
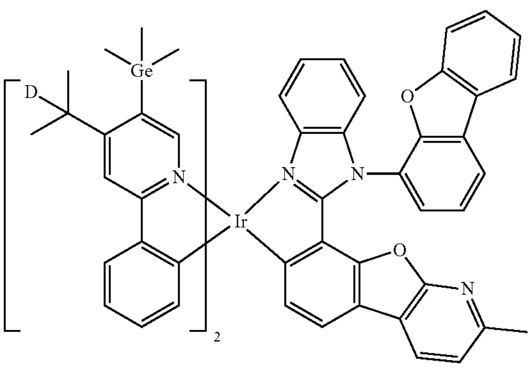
3309
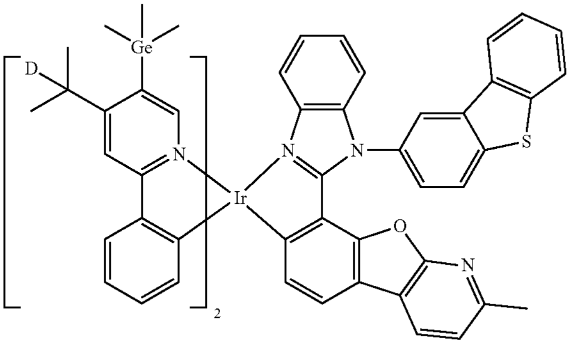
3310
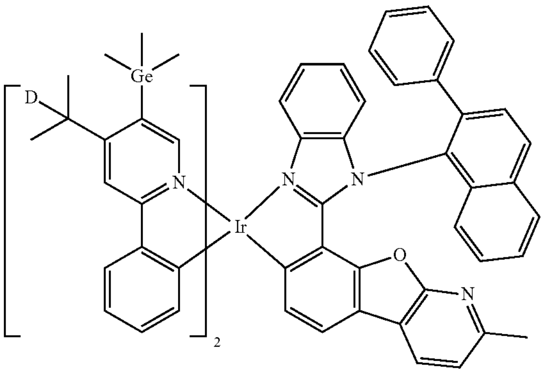
3311
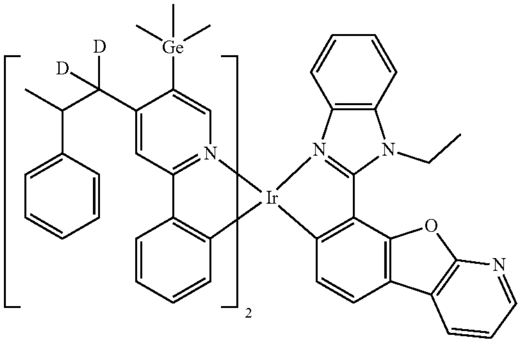
-continued
3312
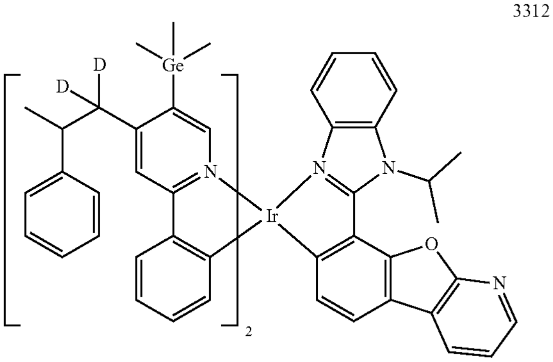
3313
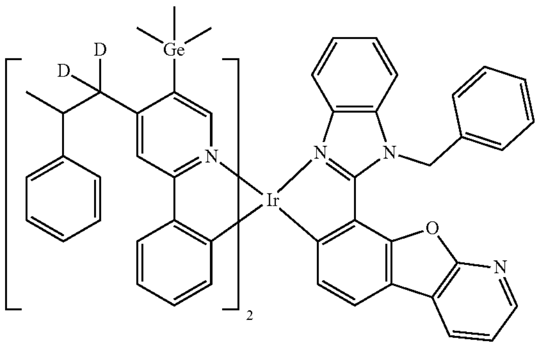
3314
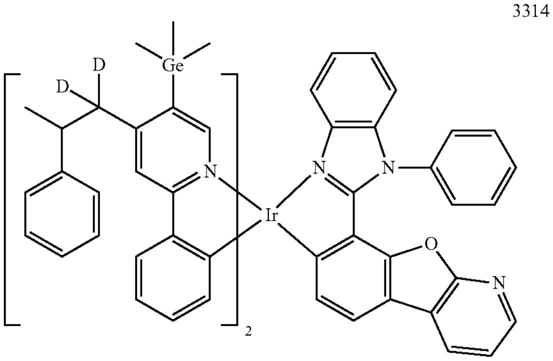
3315
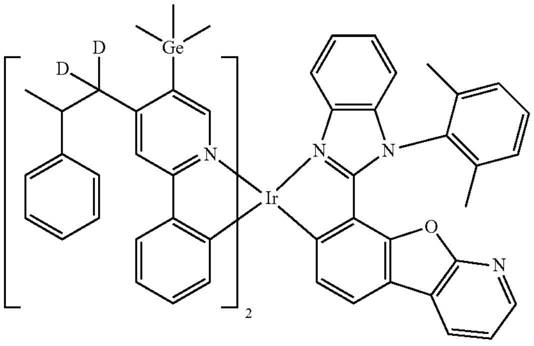

-continued
3316
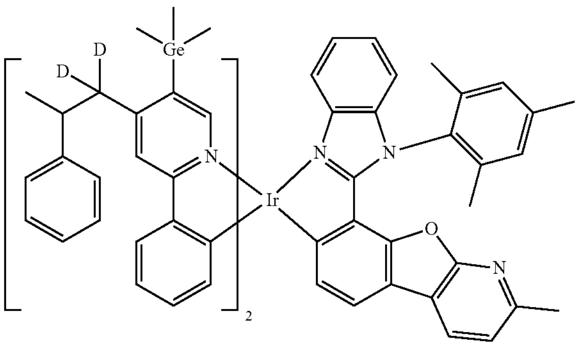
3317
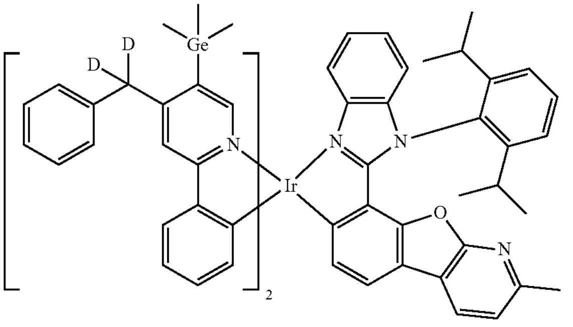
3318
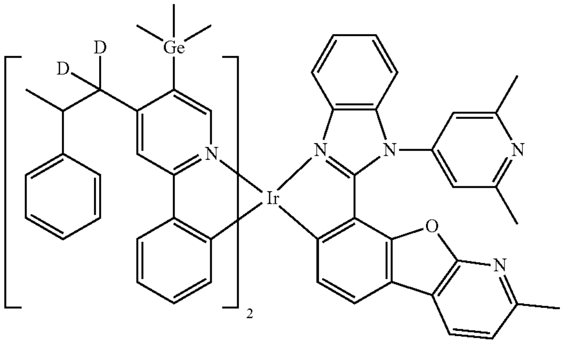
3319
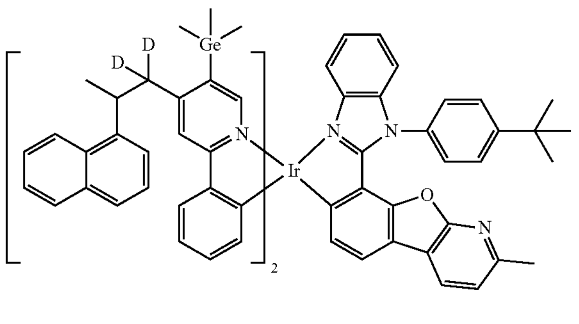
-continued
3320
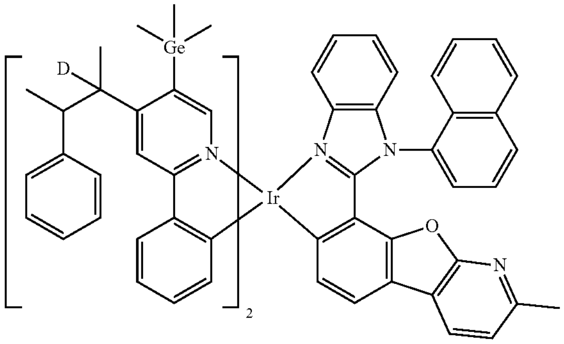
3321
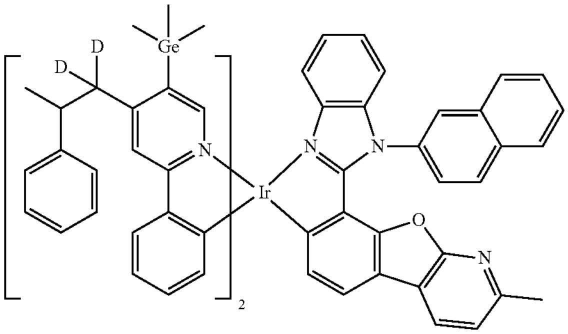
3322
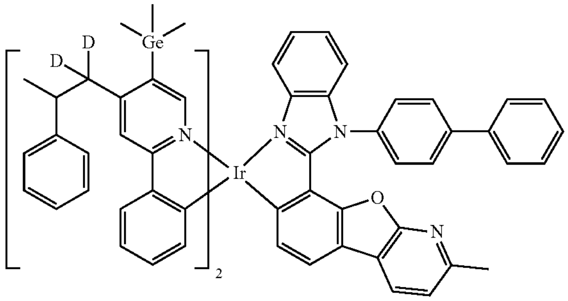
3323
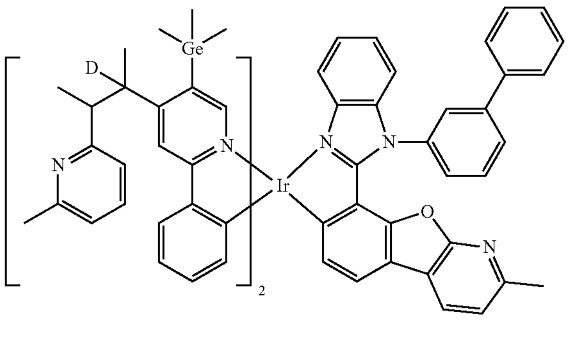

-continued
3324
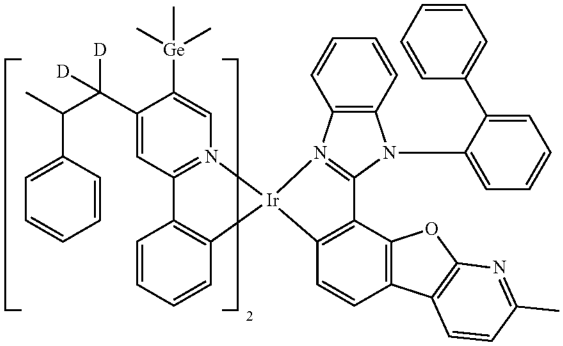
3325
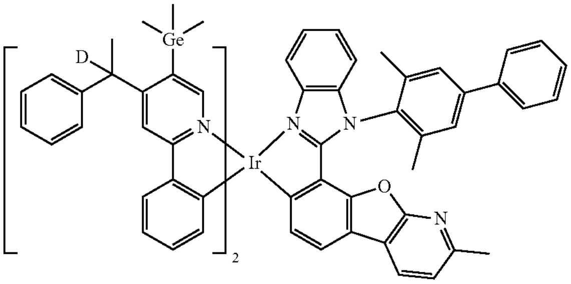
3326
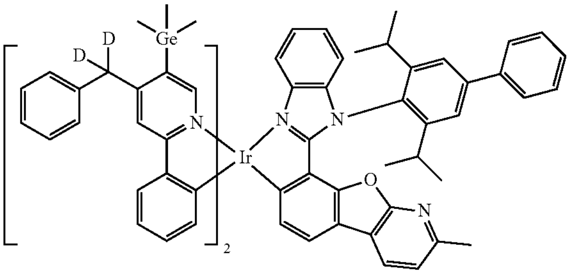
3327
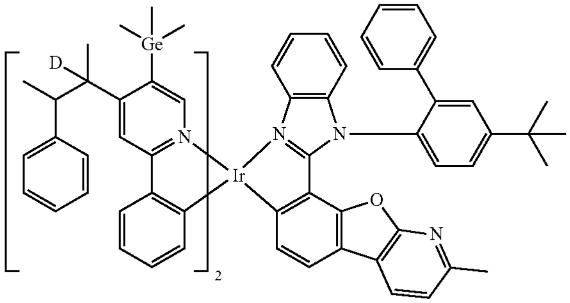
-continued
3328
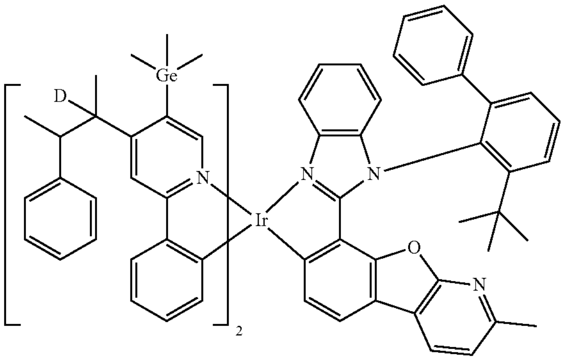
3329
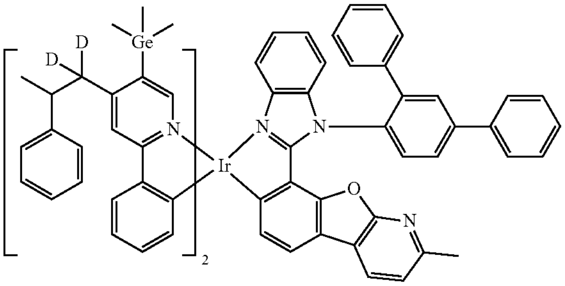
3330
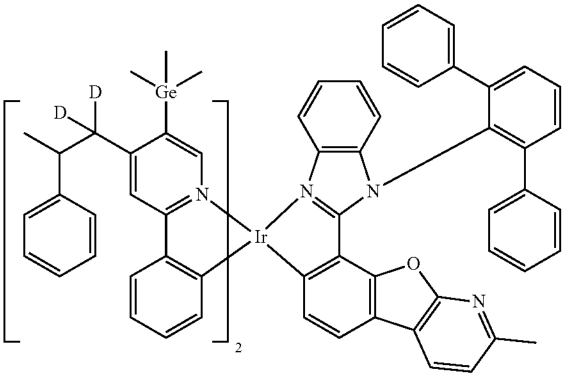
3331
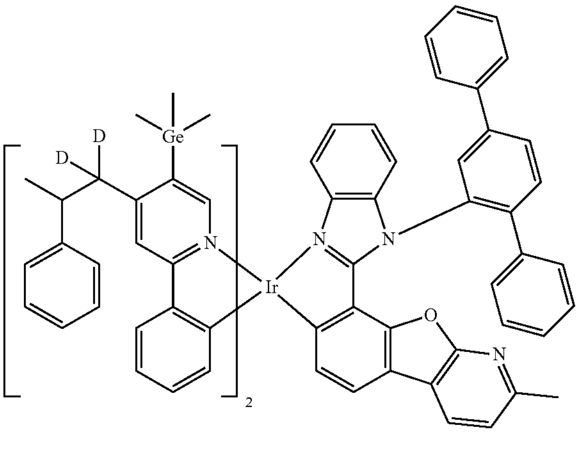

-continued
3332
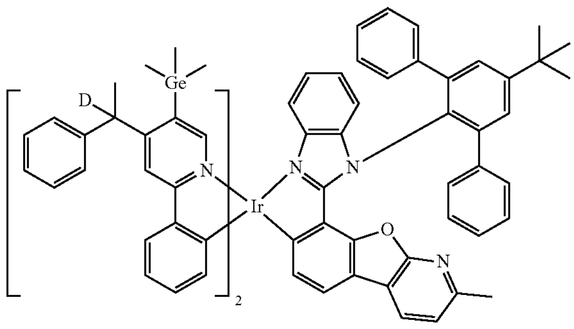
3333
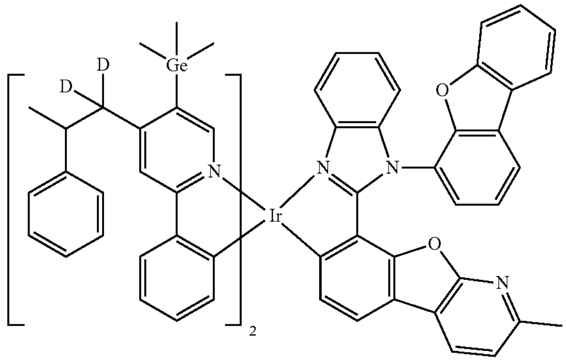
3334
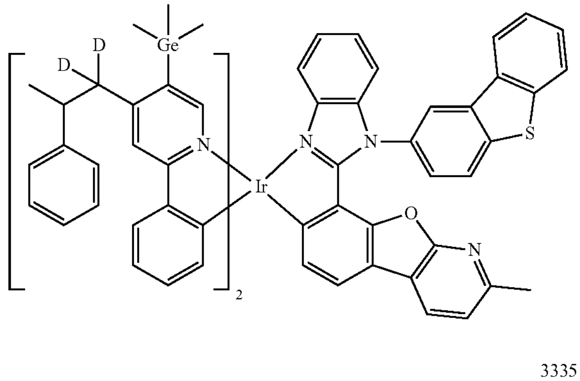
3335
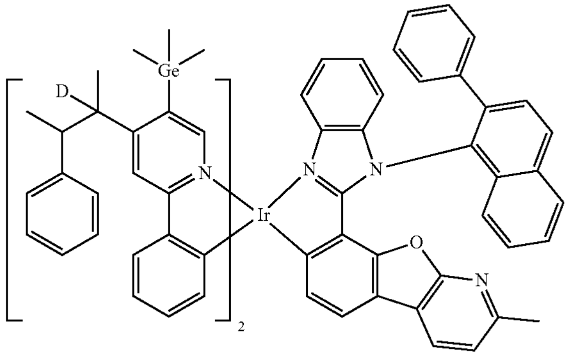
-continued
3336
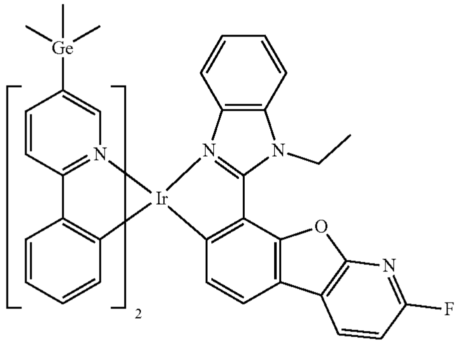
3337
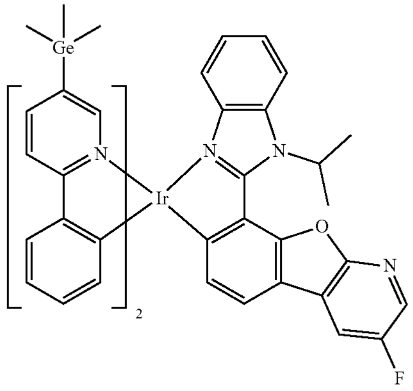
3338
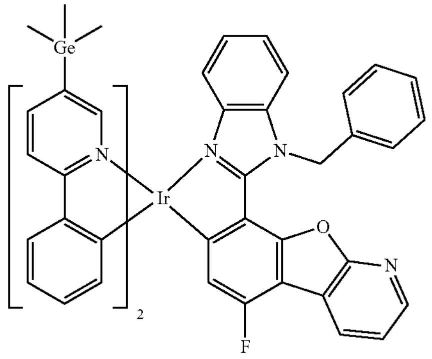
3339
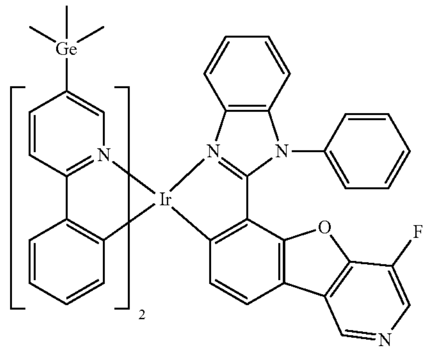

-continued
3340
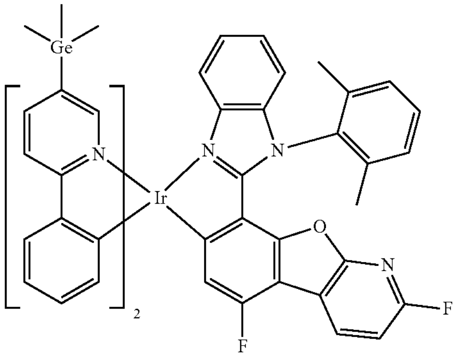
3341
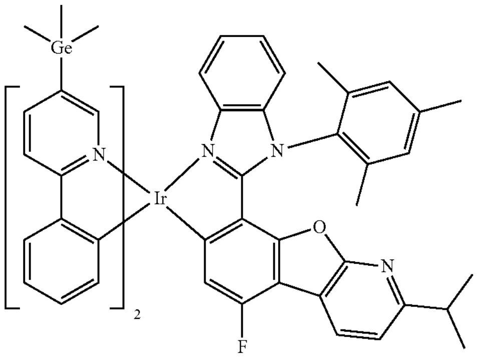
3342
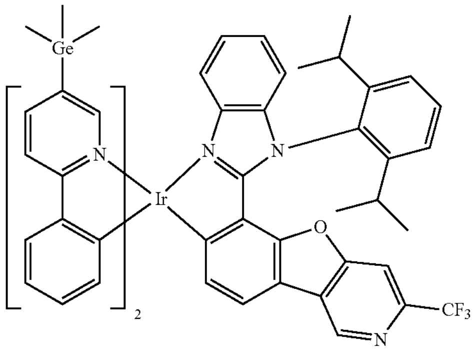
3343
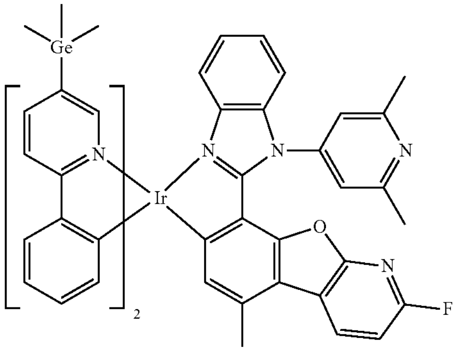
-continued
3344
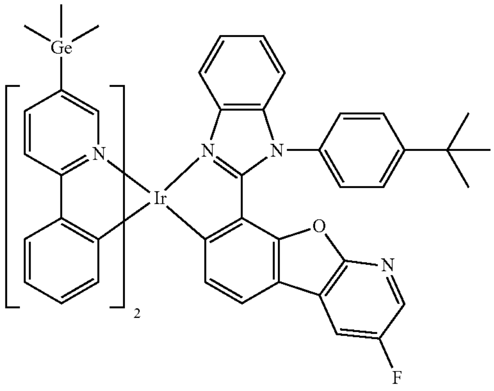
3345
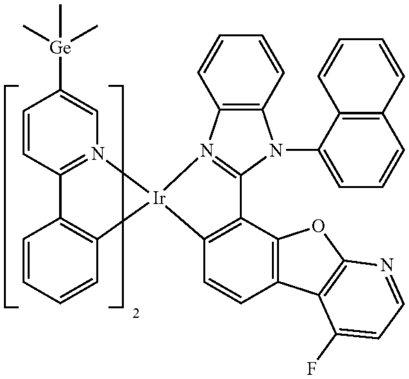
3346
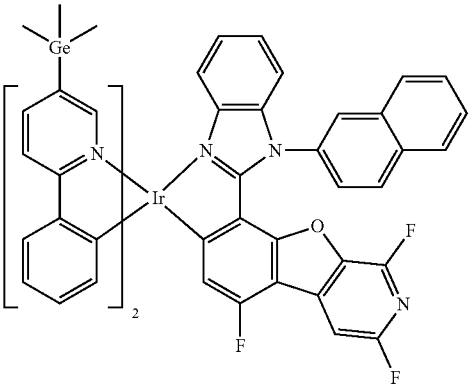
3347
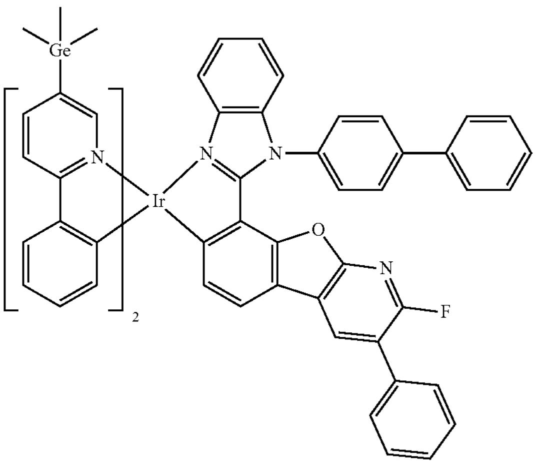

-continued
3348
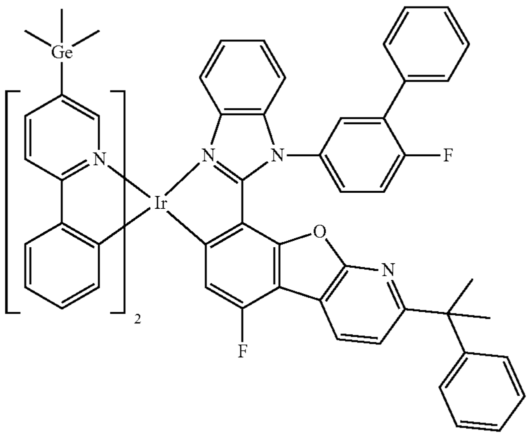
3349
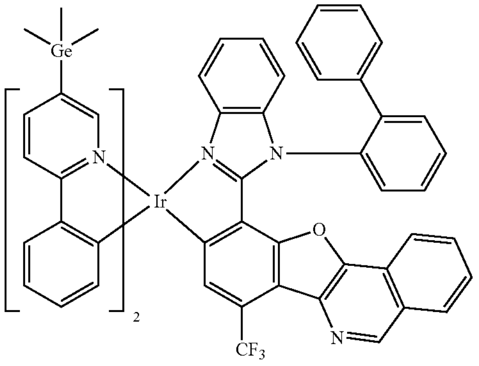
3350
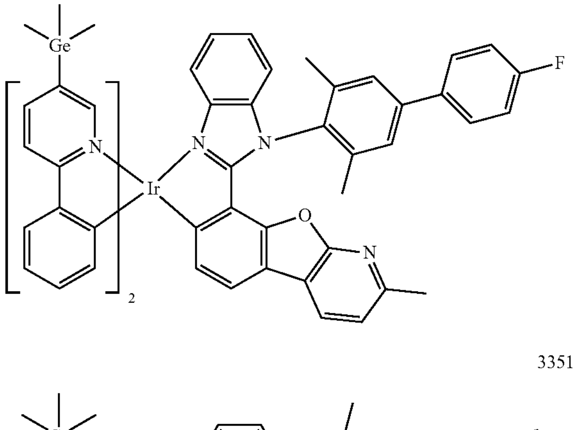
3351
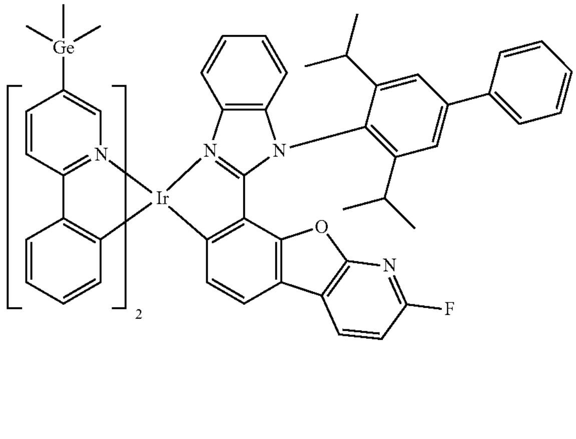
-continued
3352
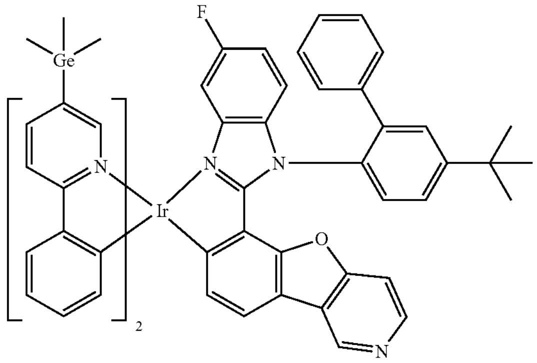
3353
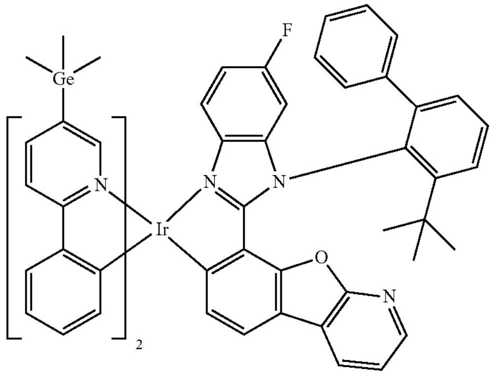
3354
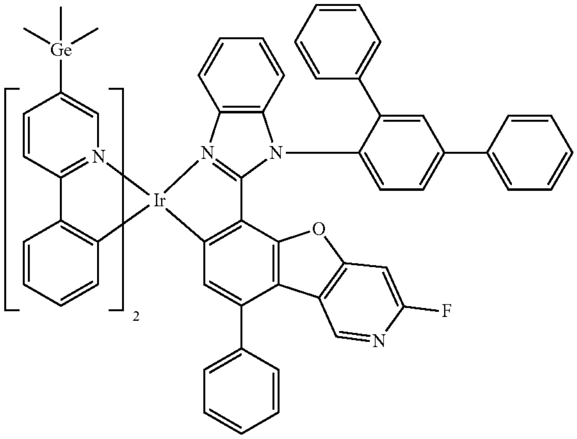
3355
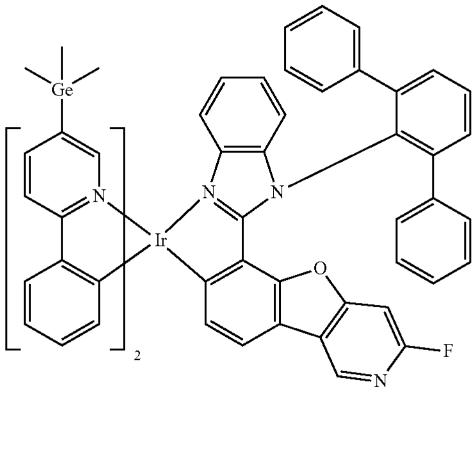

-continued
3356
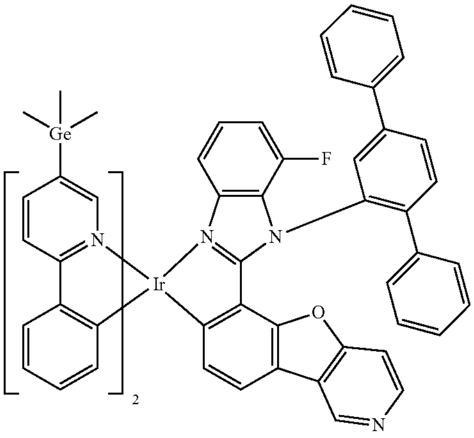
3357
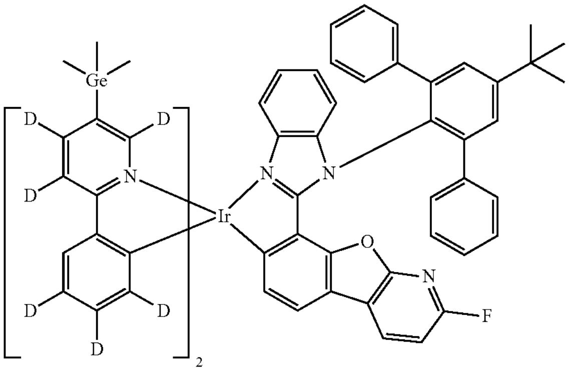
3358
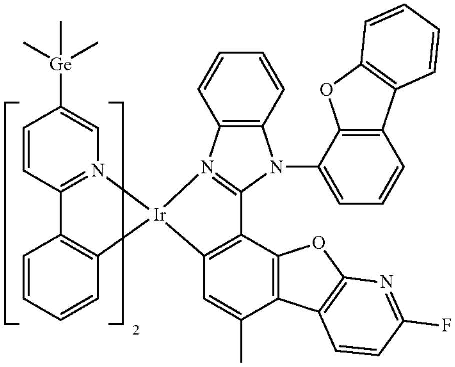
-continued
3359
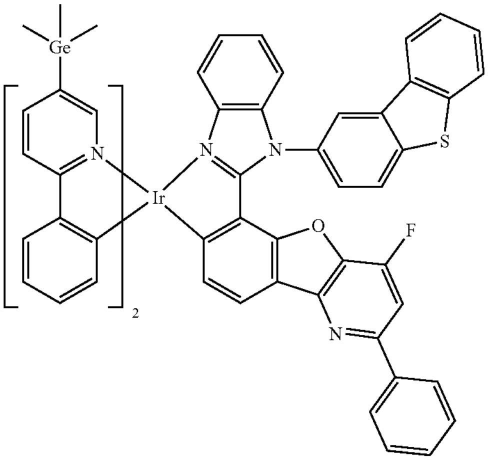
3360
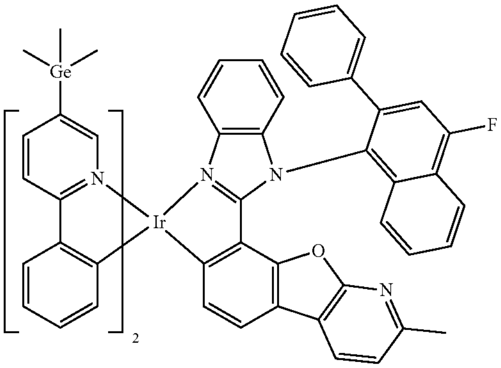
3361
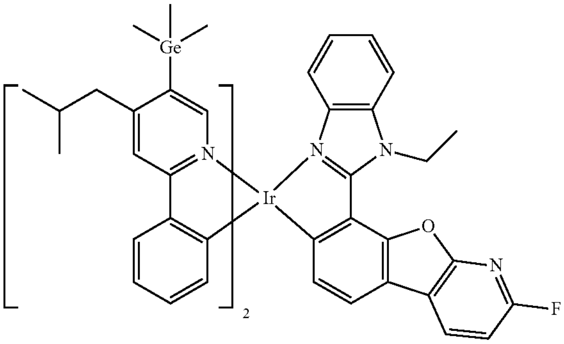
3362
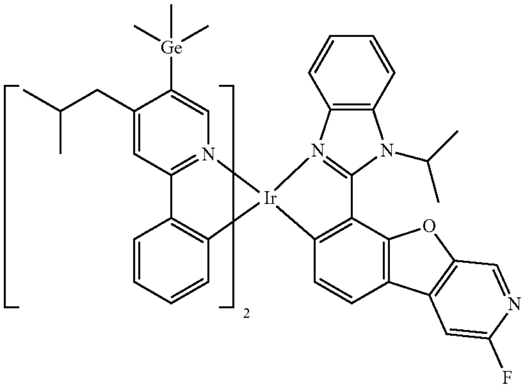

-continued
3363
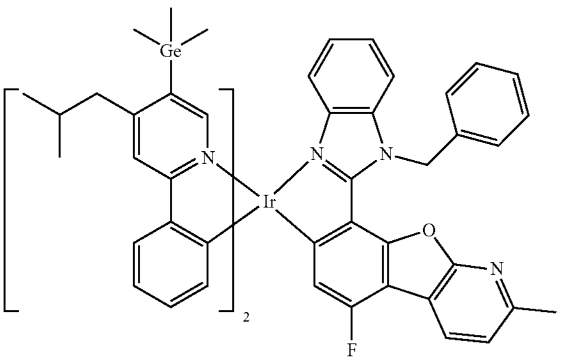
3364
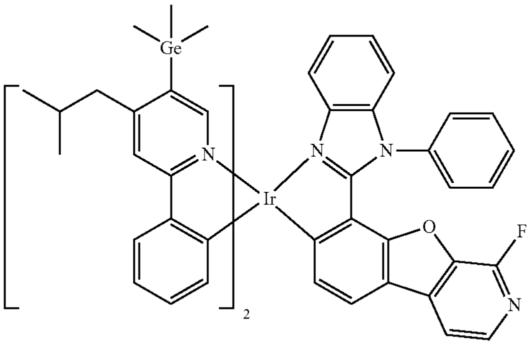
3365
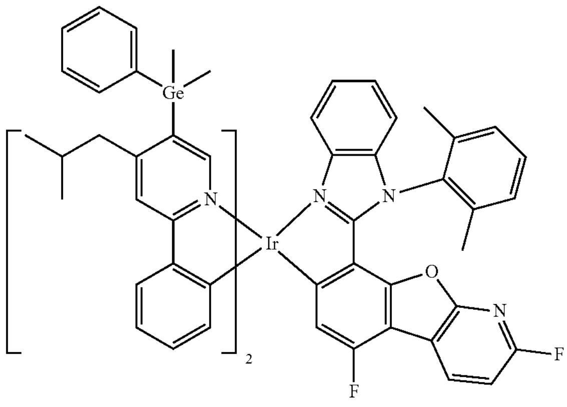
3366
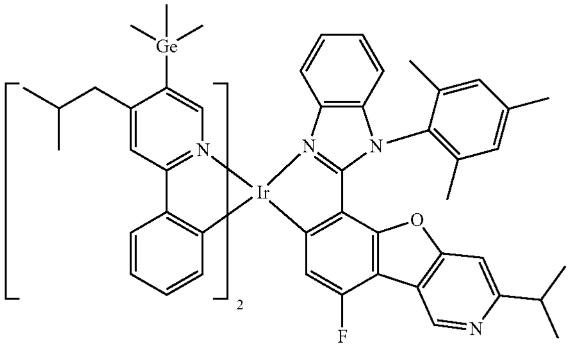
-continued
3367
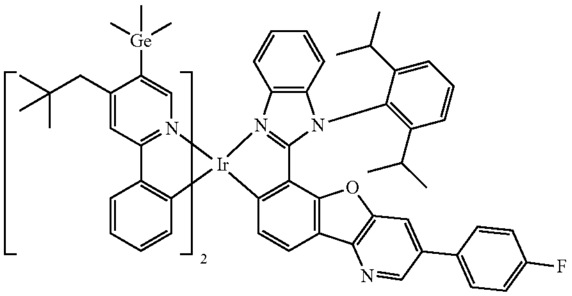
3368
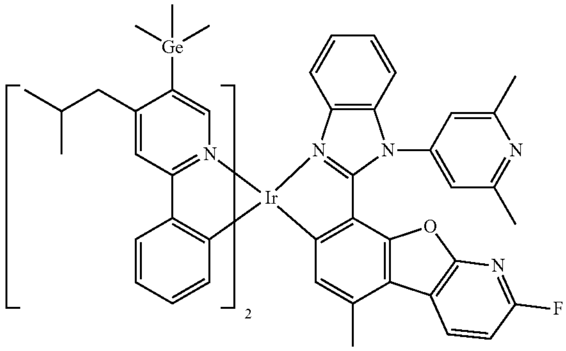
3369
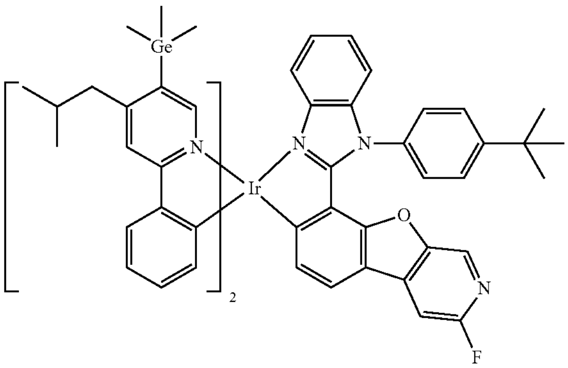
3370
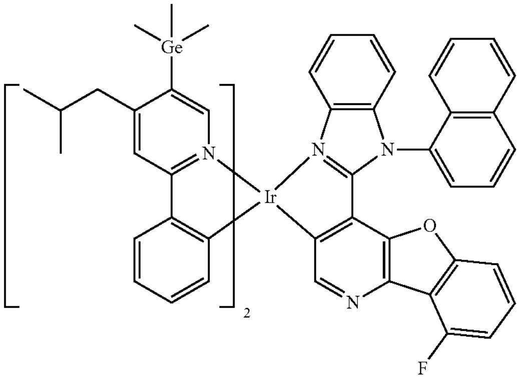

-continued
3371
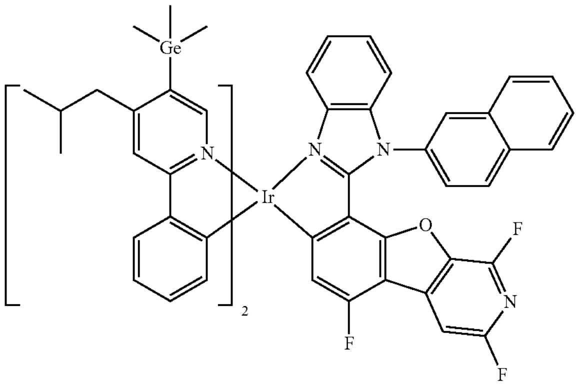
3372
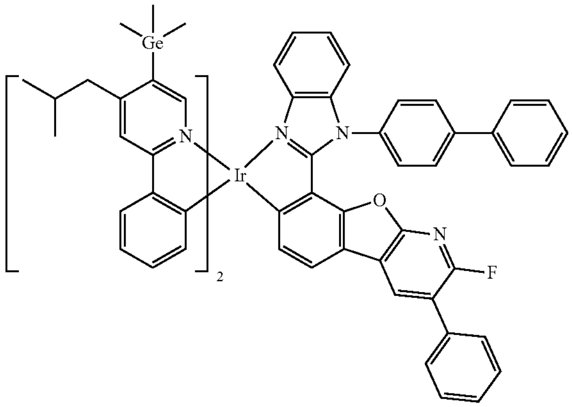
3373
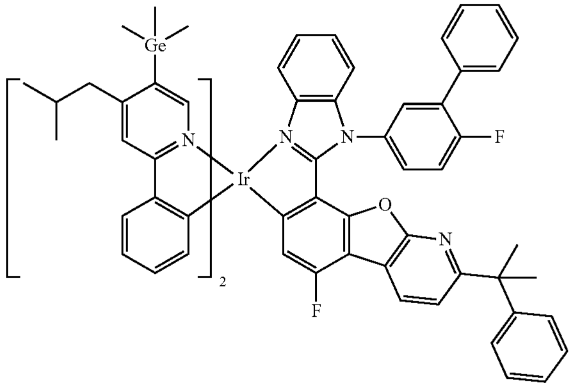
3374
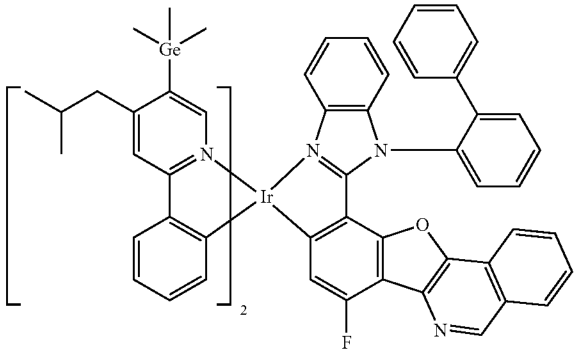
-continued
3375
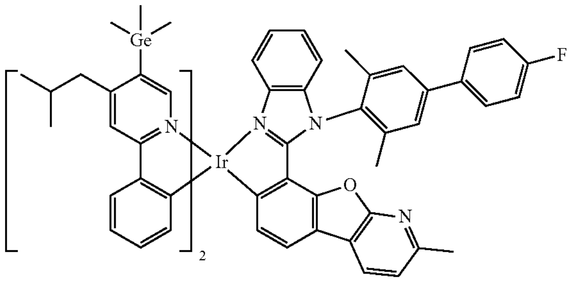
3376
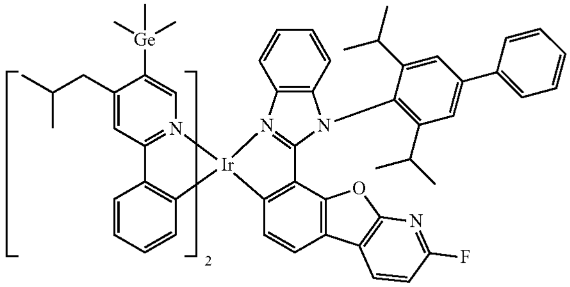
3377
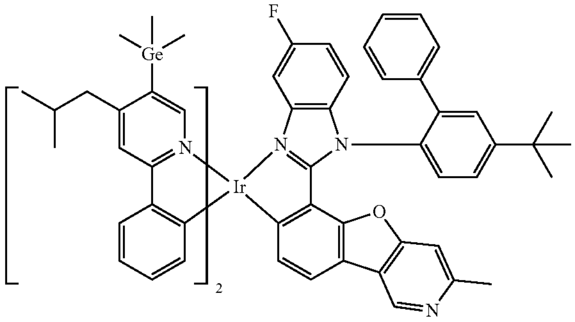
3378
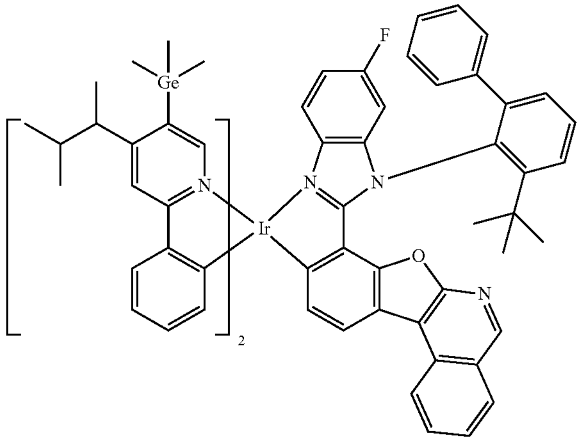

-continued
3379
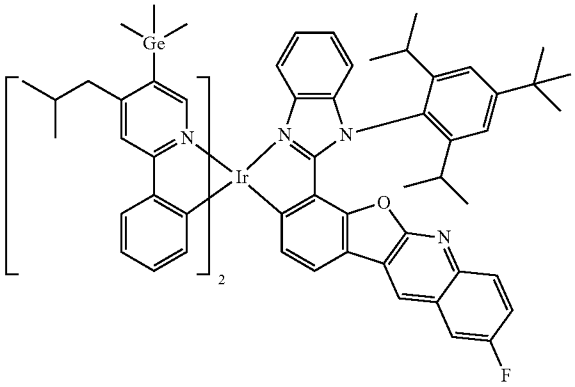
3380
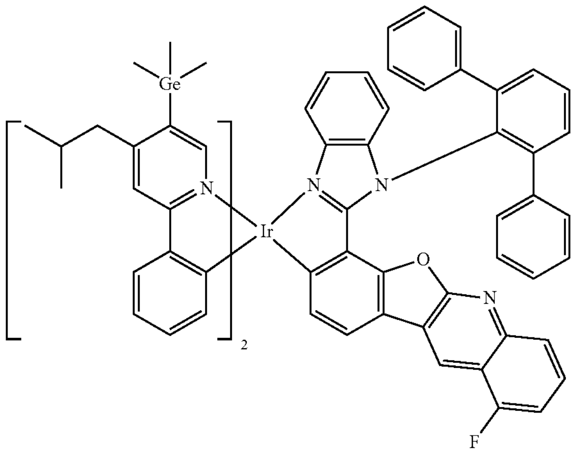
3381
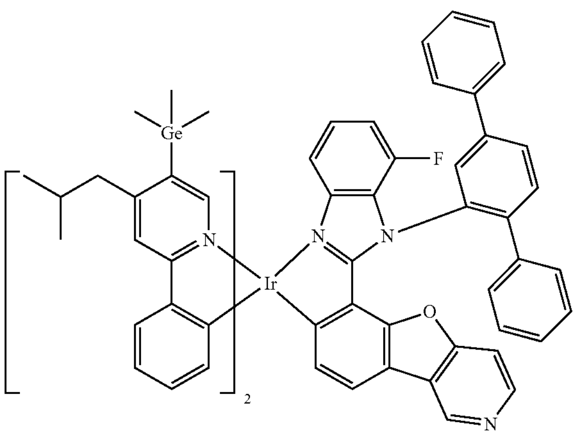
-continued
3382
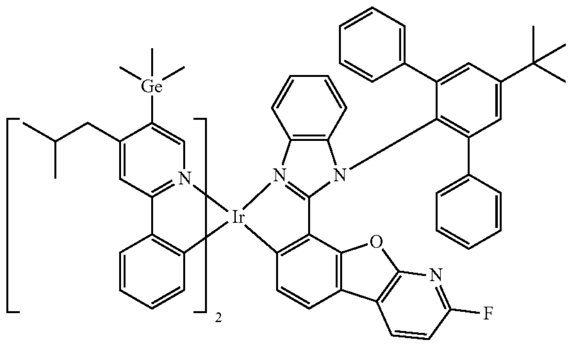
3383
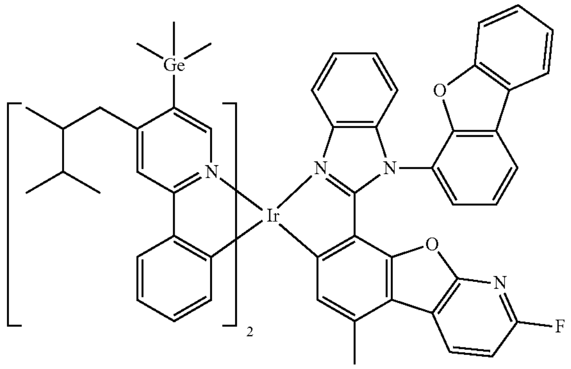
3384
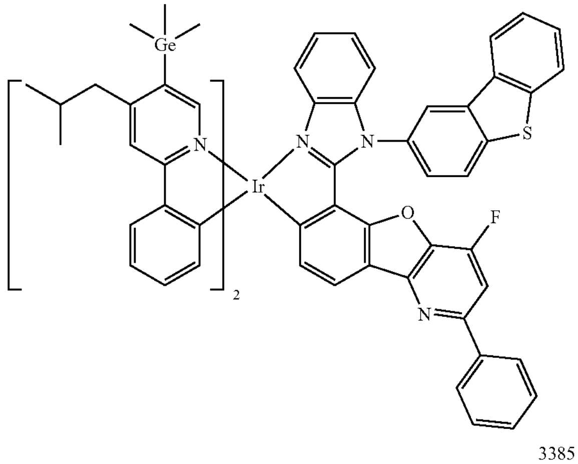
3385
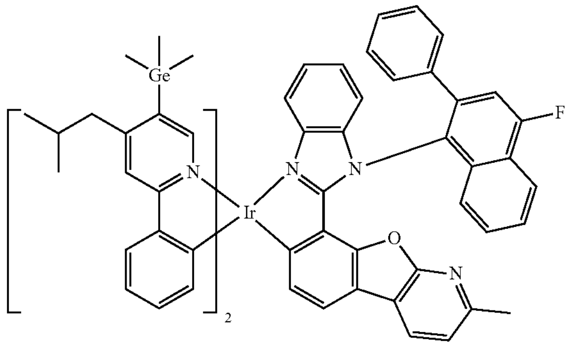

-continued
3386
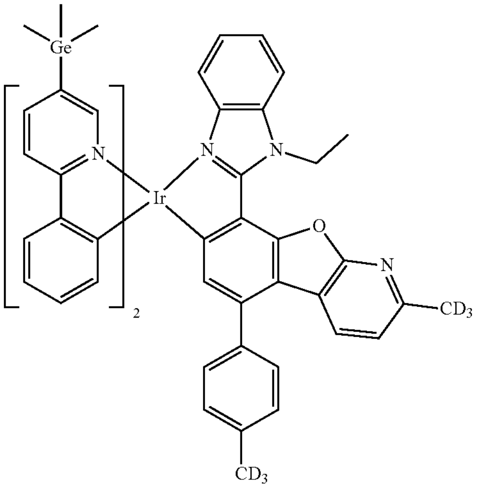
3387
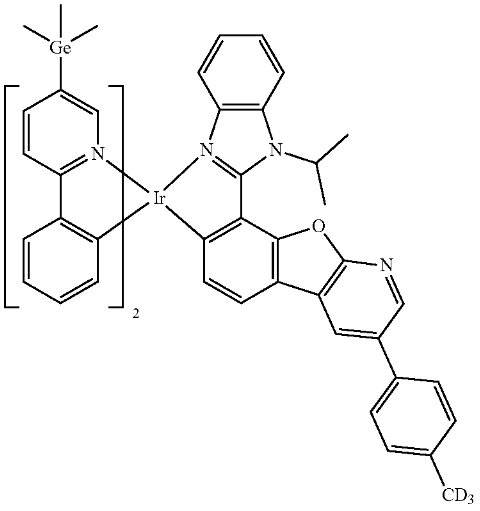
3388
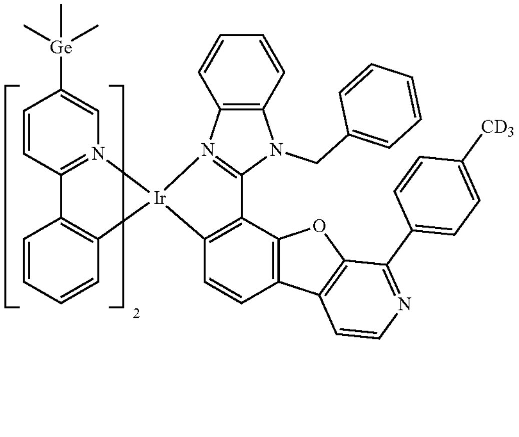
-continued
3389
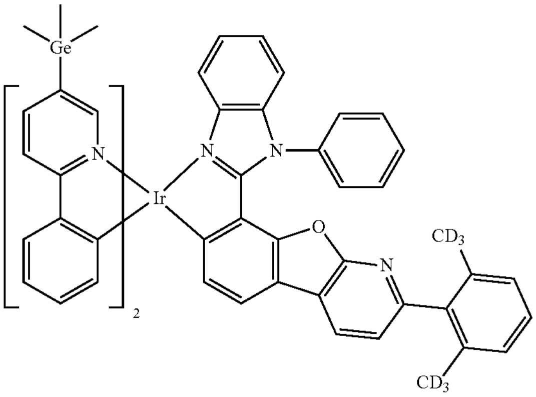
3390
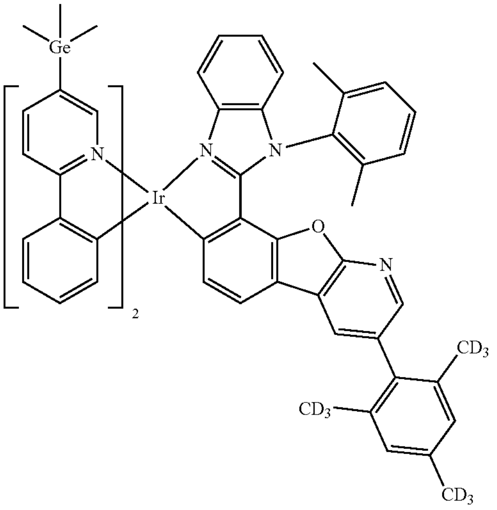
3391
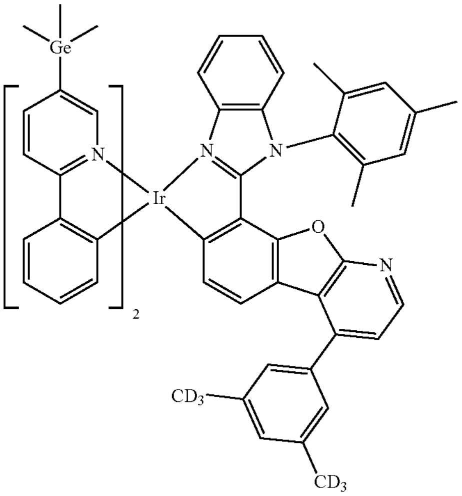

-continued
3392
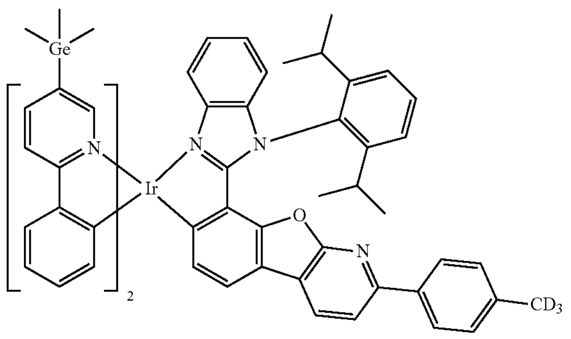
3393
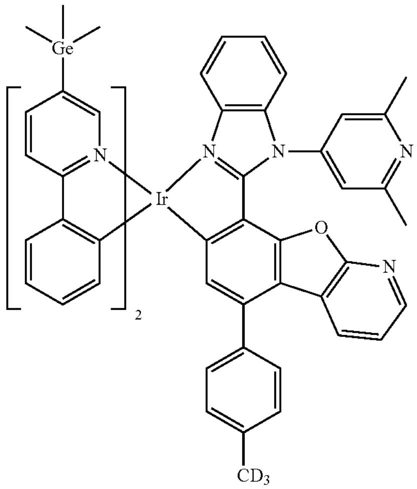
3394
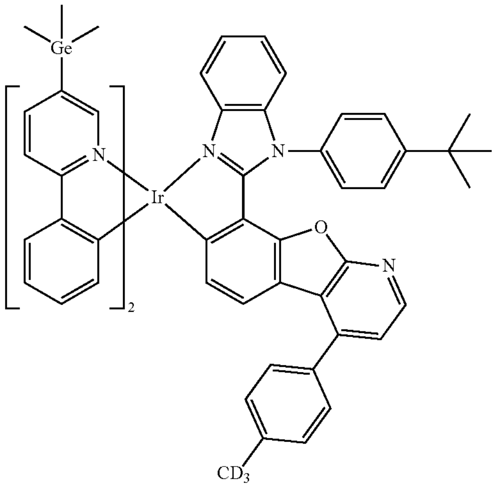
-continued
3395
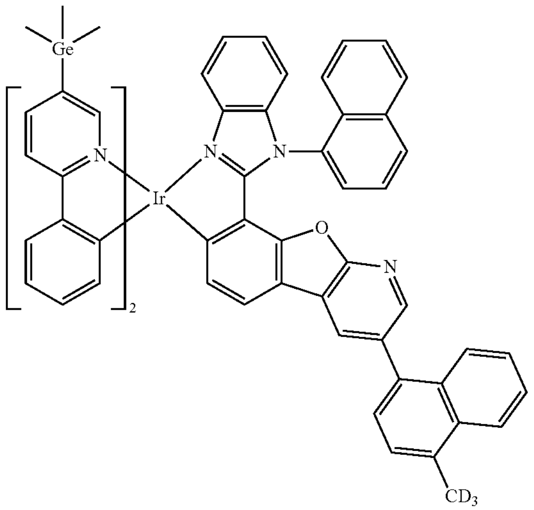
3396
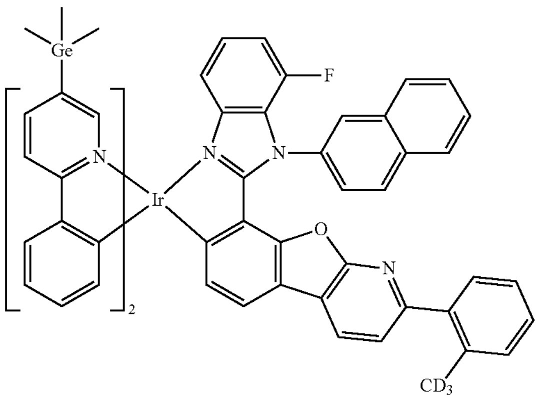
3397
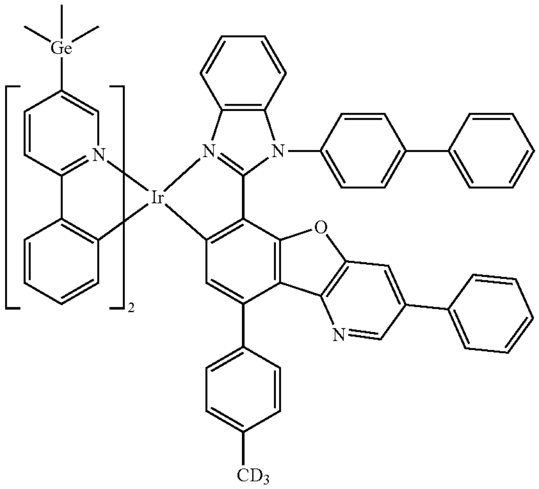

3398
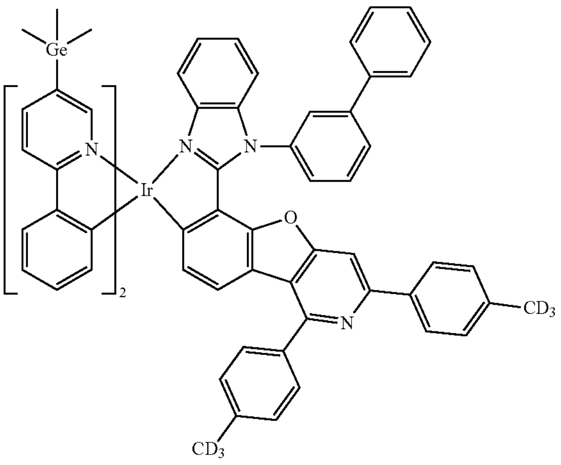
3399
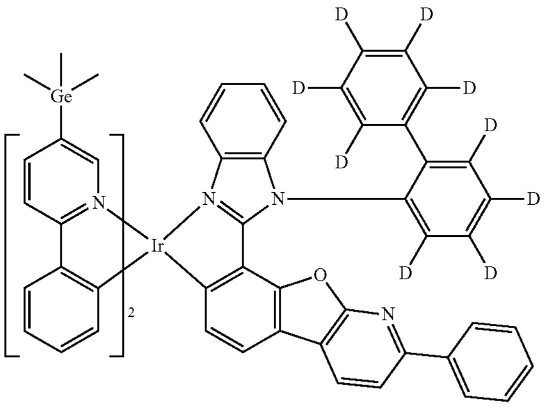
3400
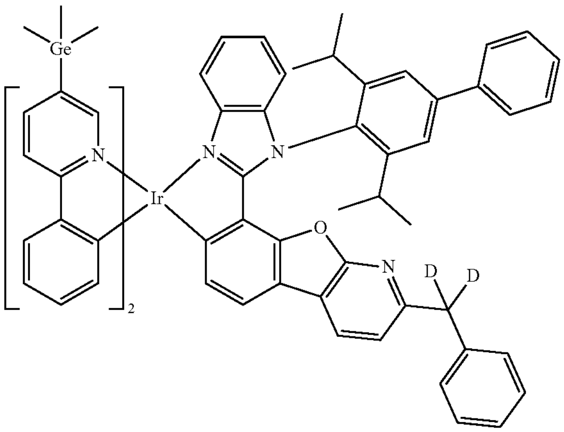
3401
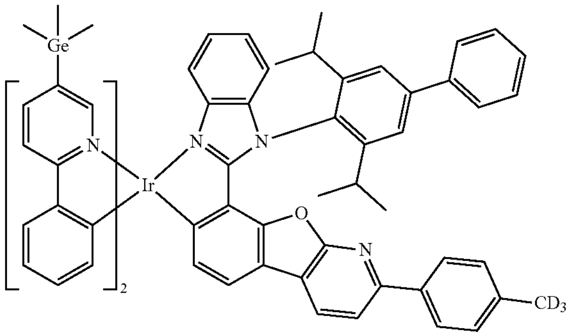
3402
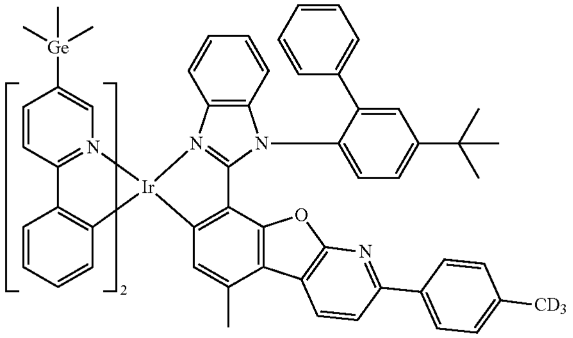
3403
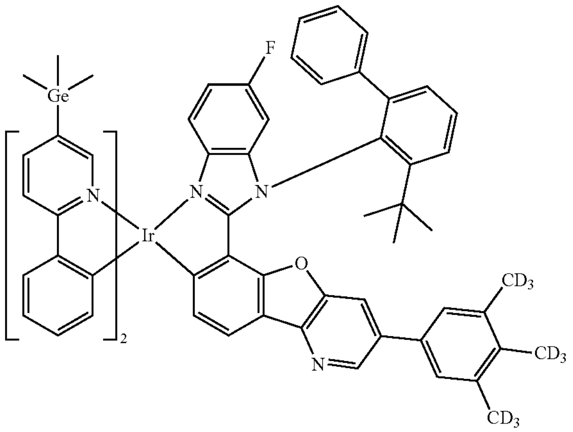
3404
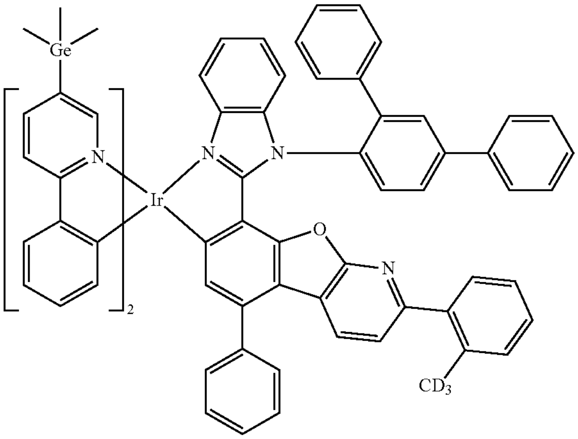

-continued
3405
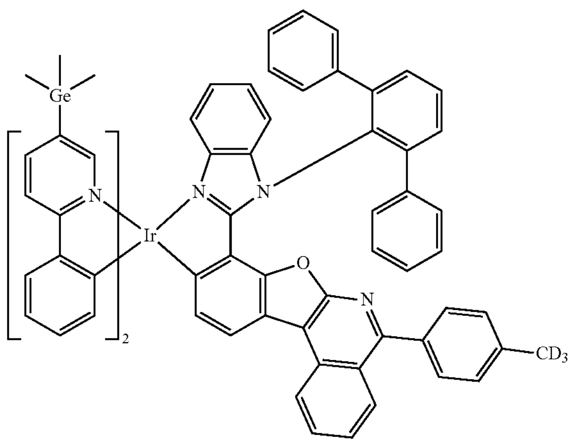
3406
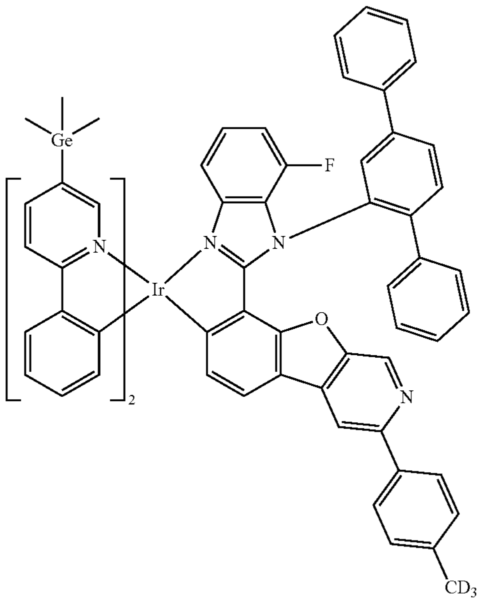
3407
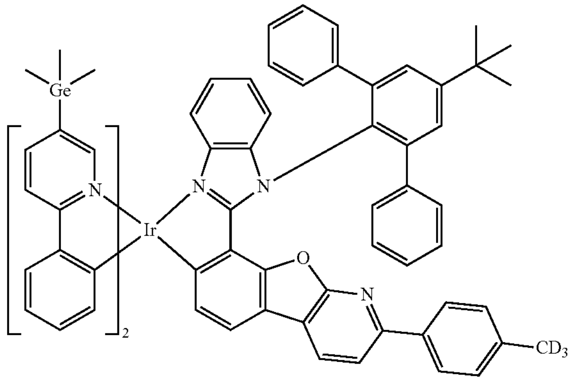
-continued
3408
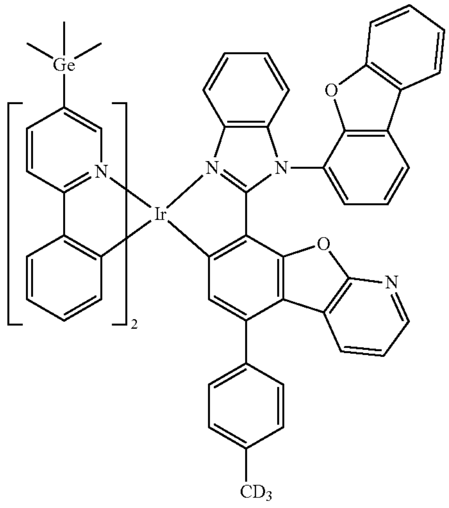
3409
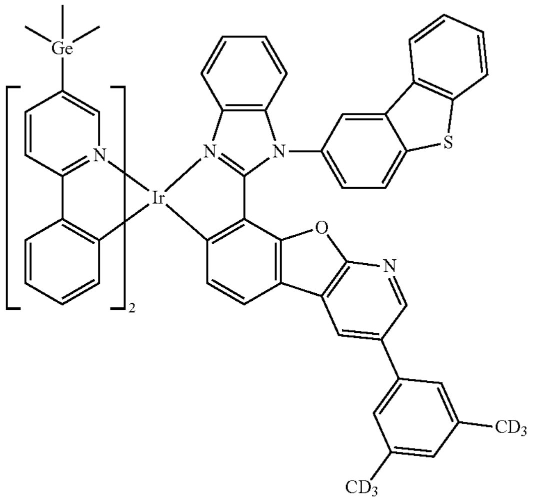
3410
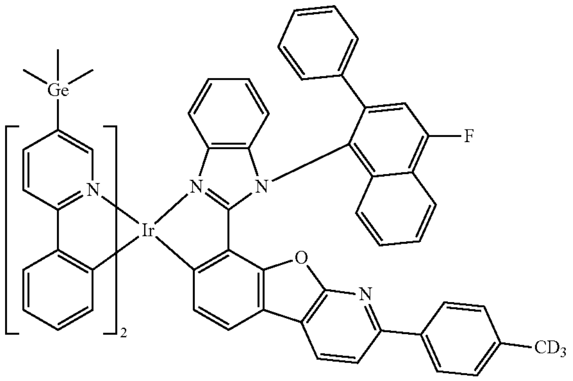

-continued
3411
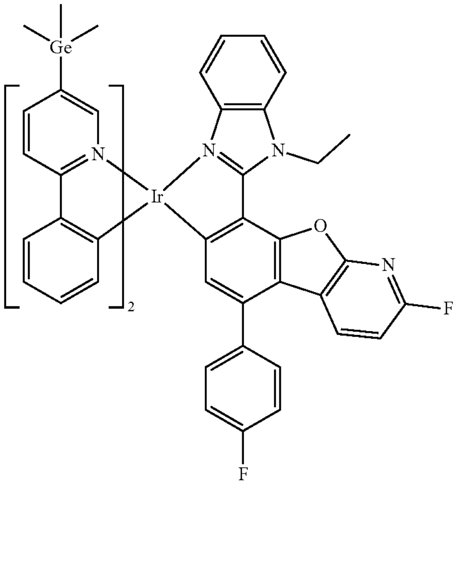
3412
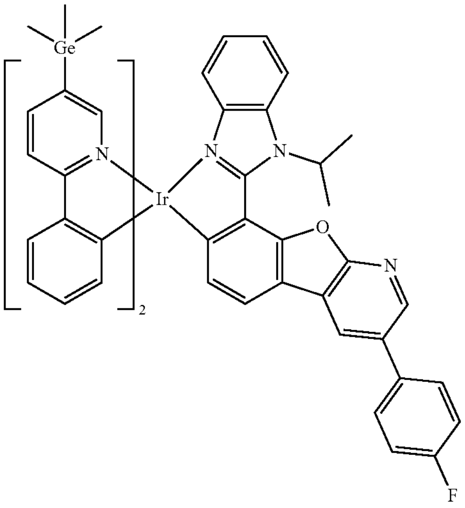
3413
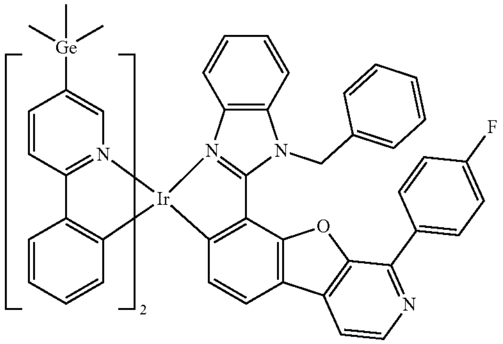
-continued
3414
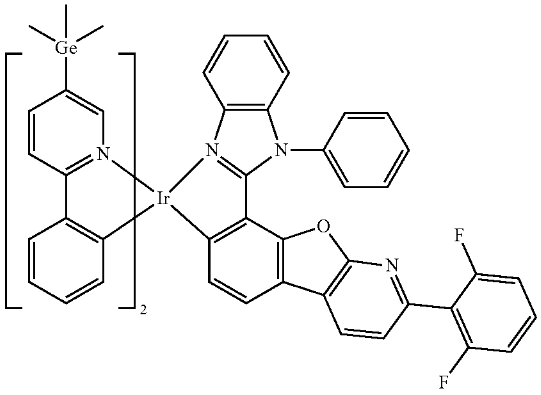
3415
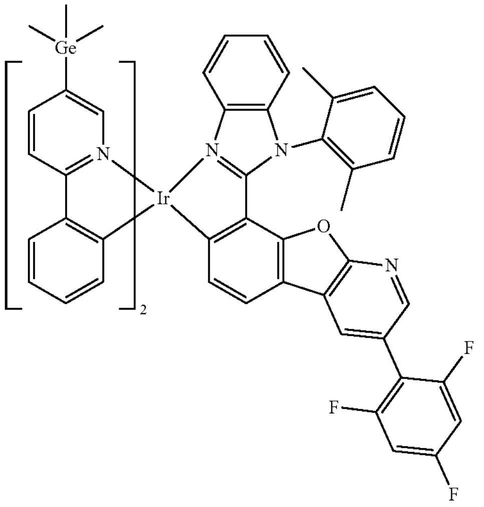
3416
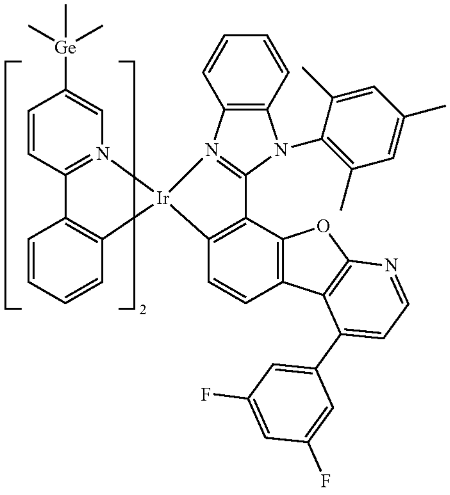

-continued
3417
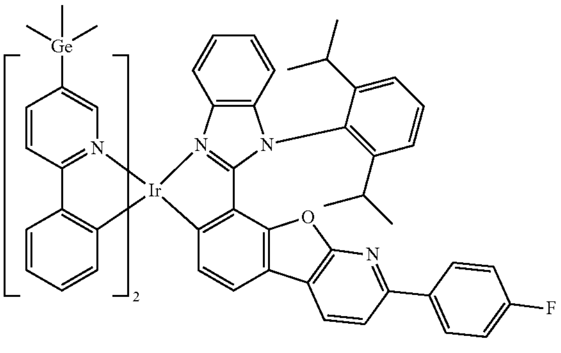
3418
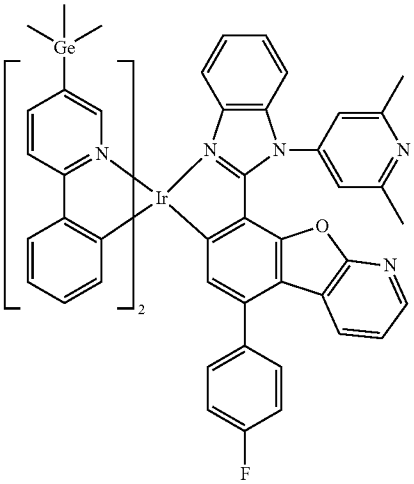
3419
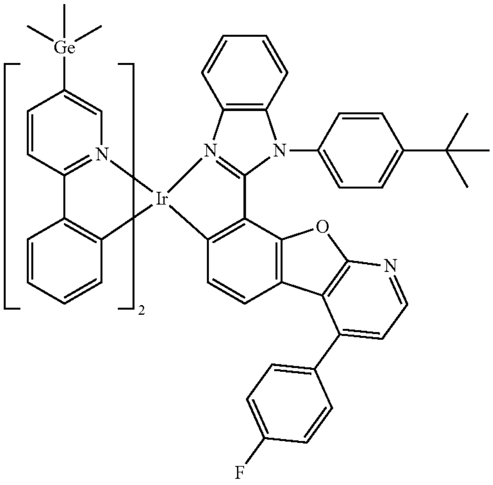
-continued
3420
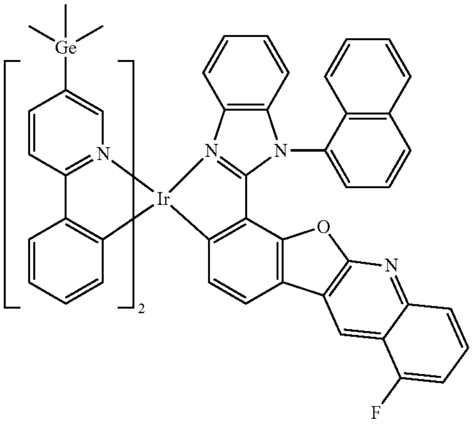
3421
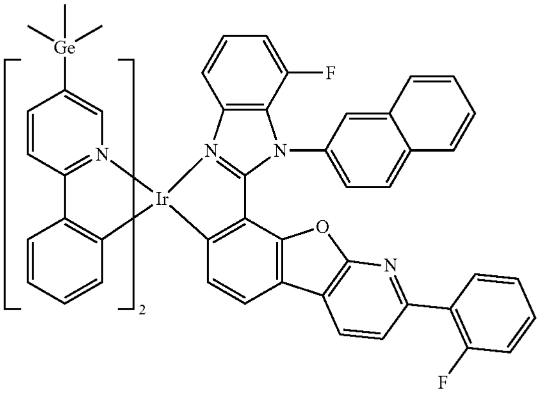
3422
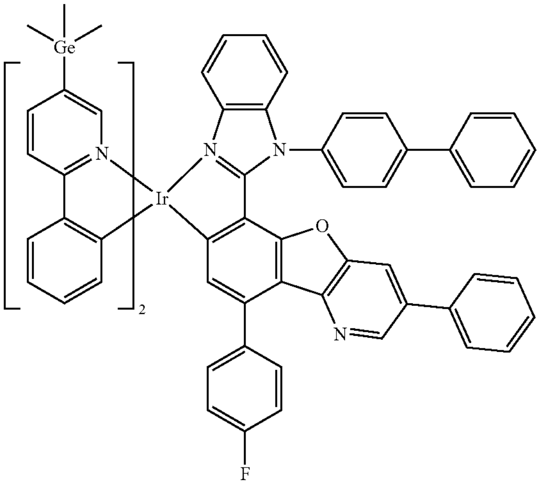

-continued
3423
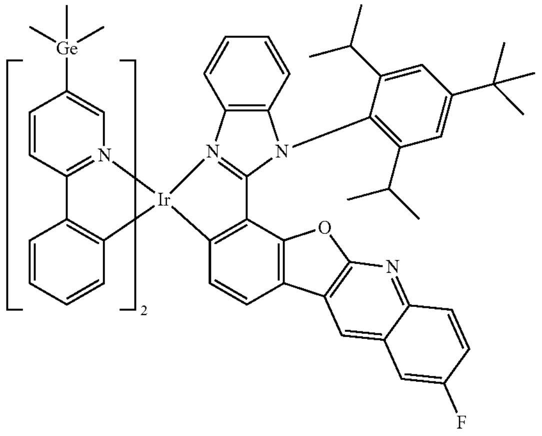
3424
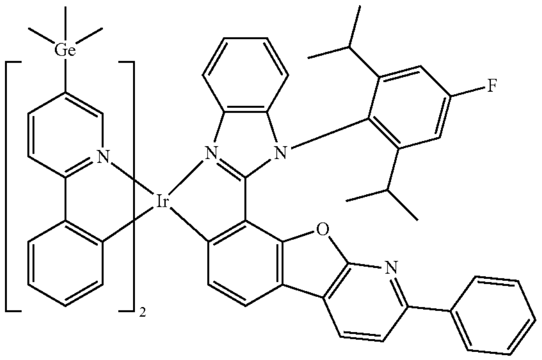
3425
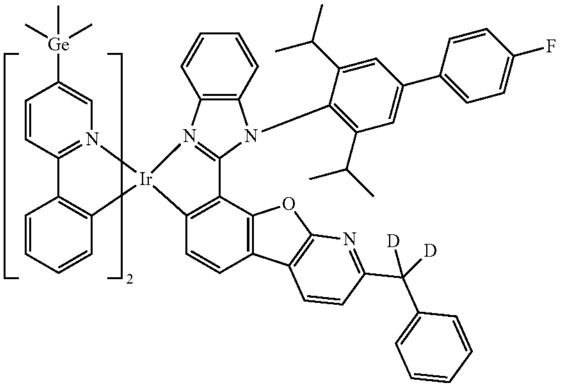
3426
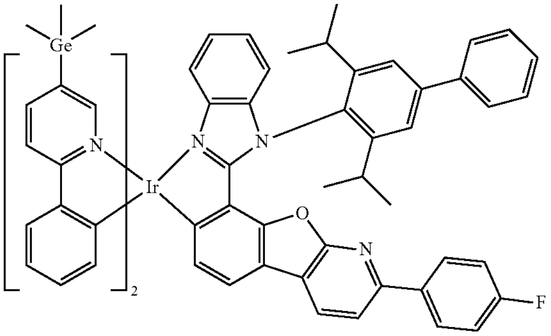
-continued
3427
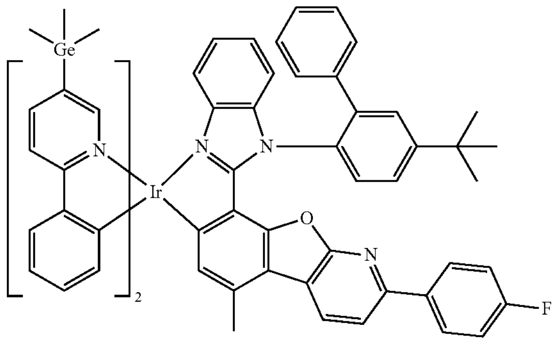
3428
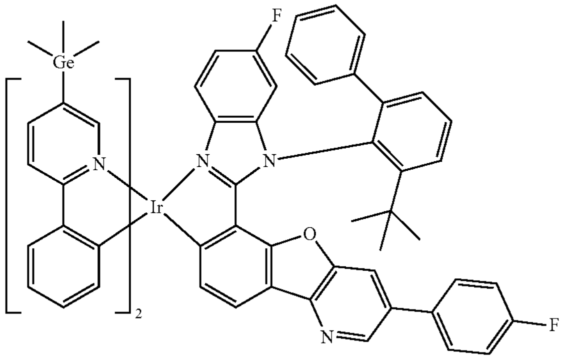
3429
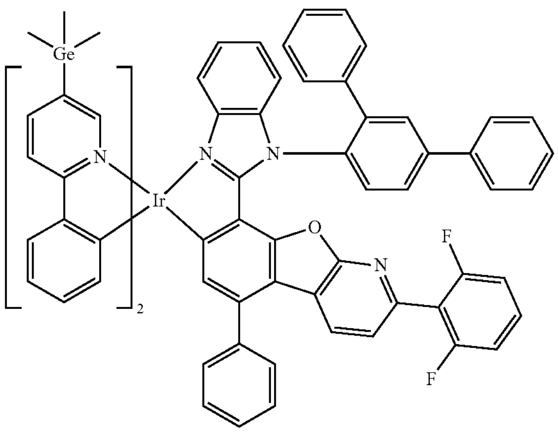

3430
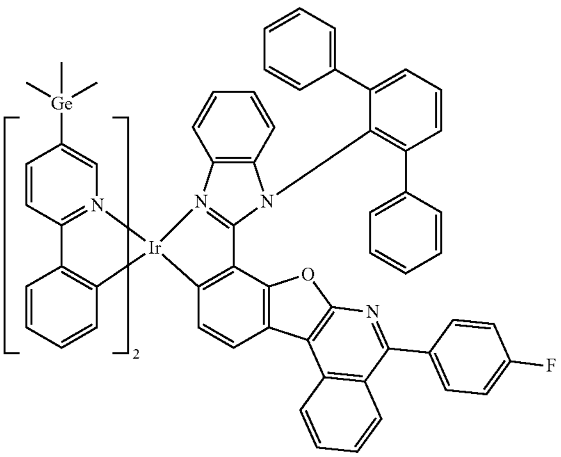
3431
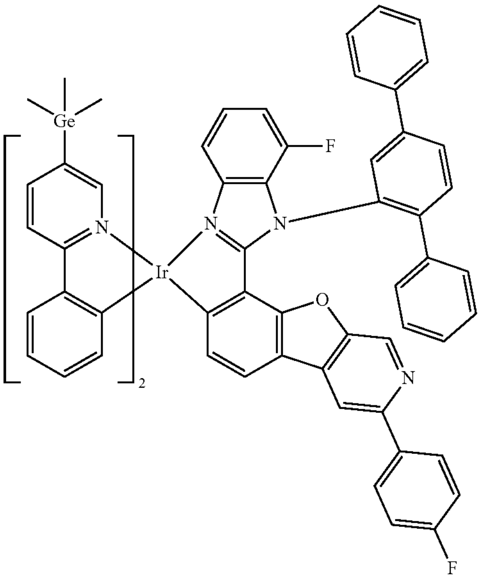
3432
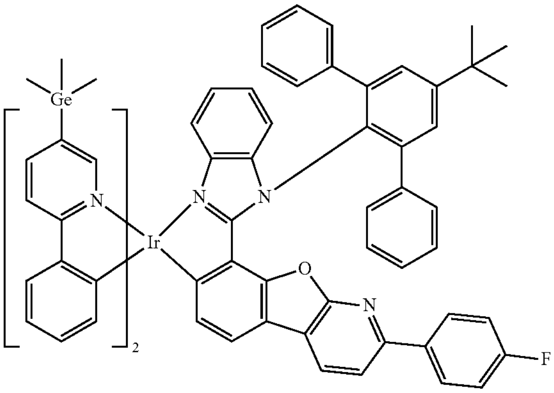
3433
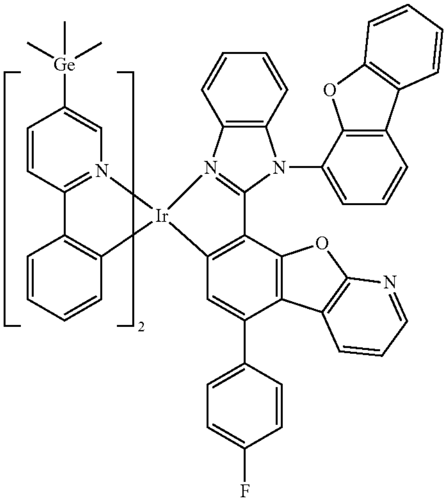
3434
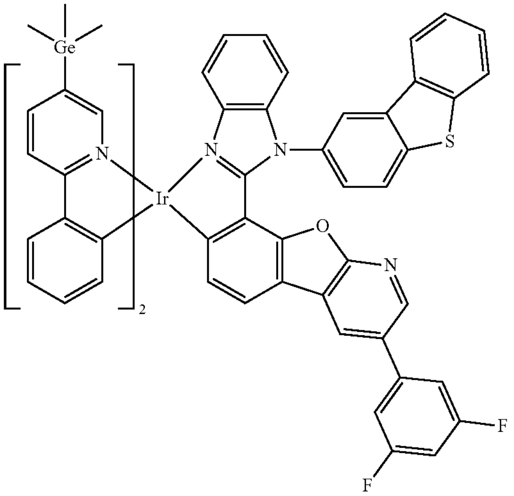
3435
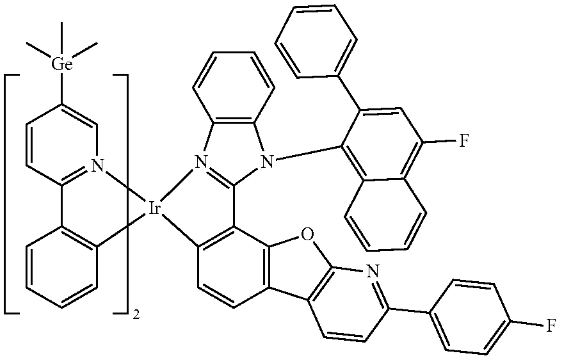

-continued
3436
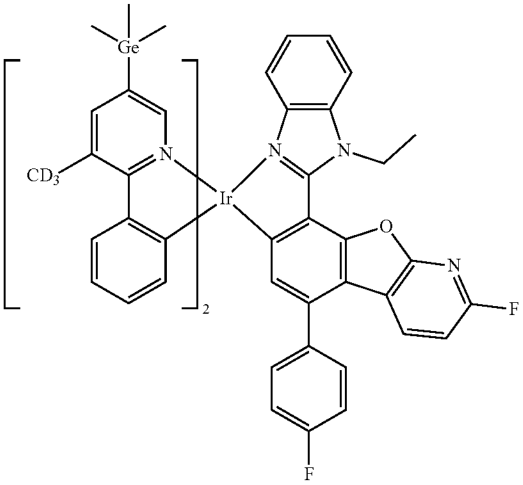
3437
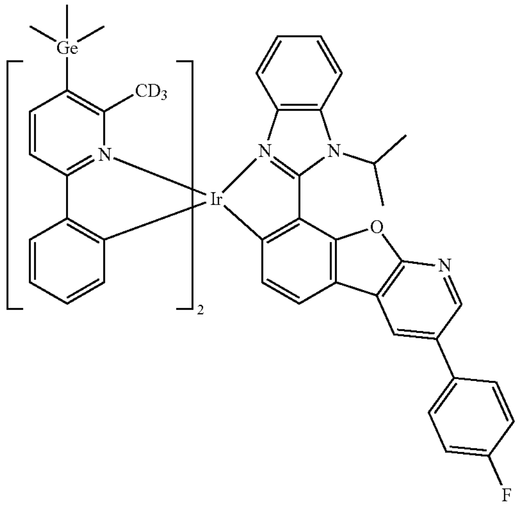
3438
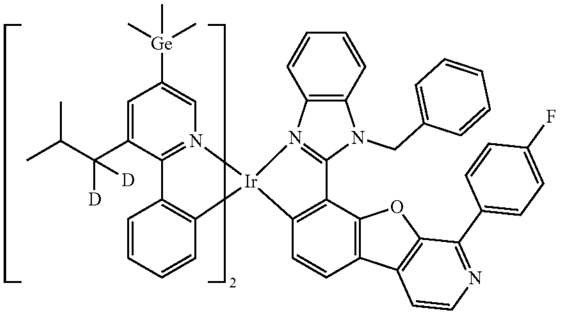
-continued
3439
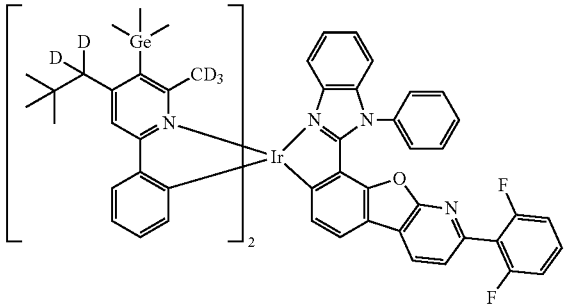
3440
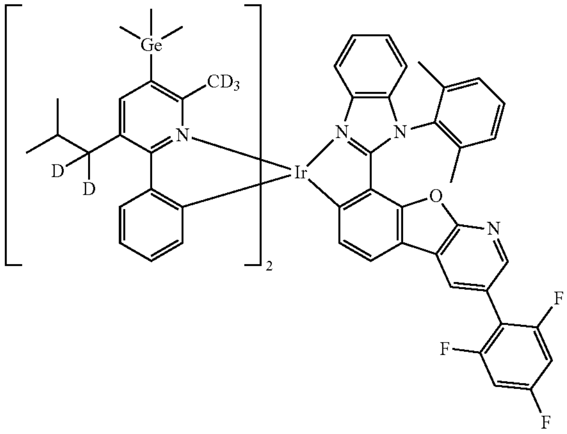
3441
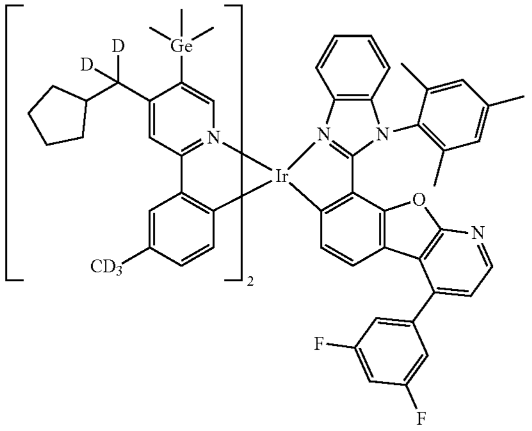
3442
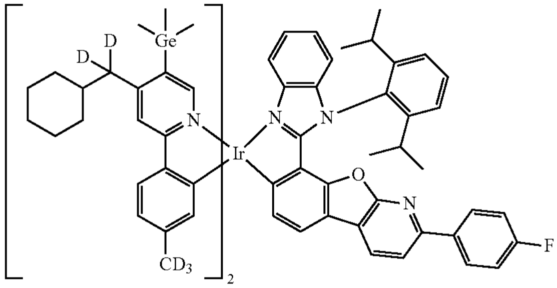

-continued
3443
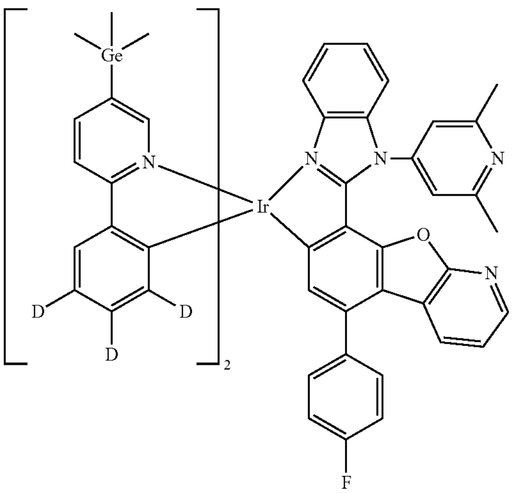
3444
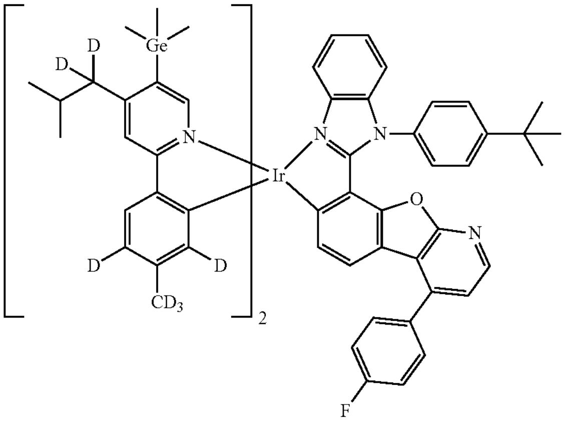
3445
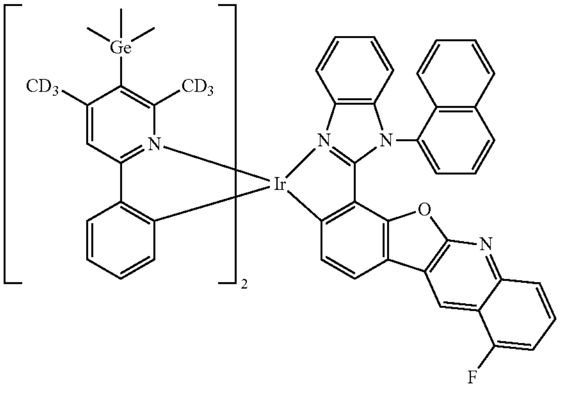
-continued
3446
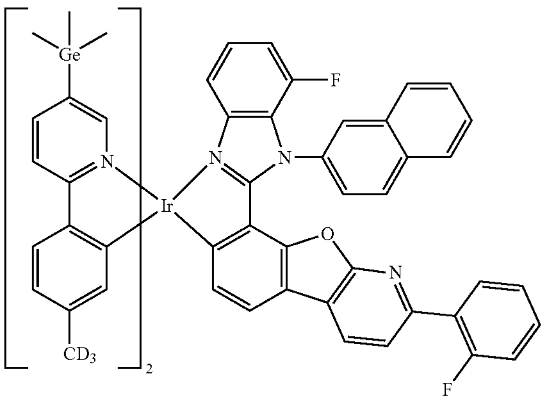
3447
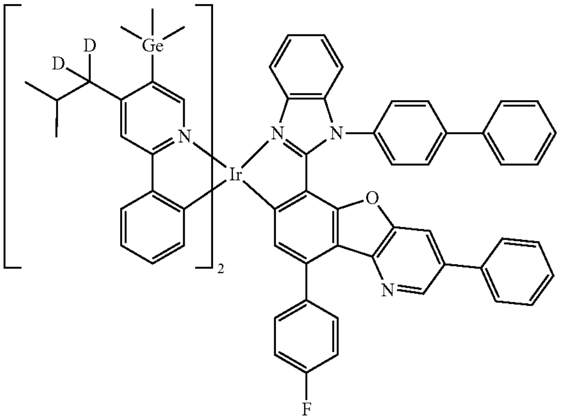
3448
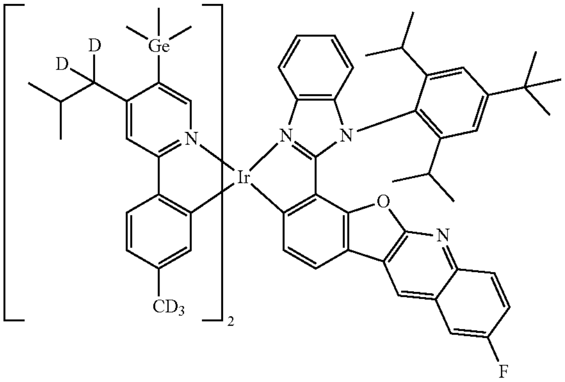
3449
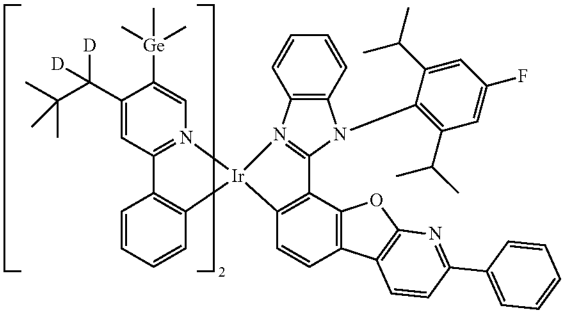

-continued
3450
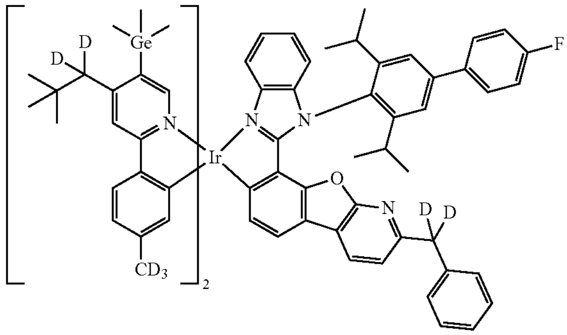
3451
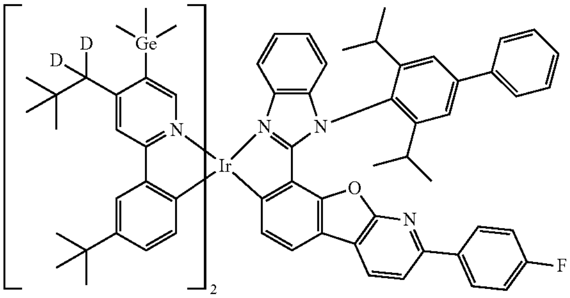
3452
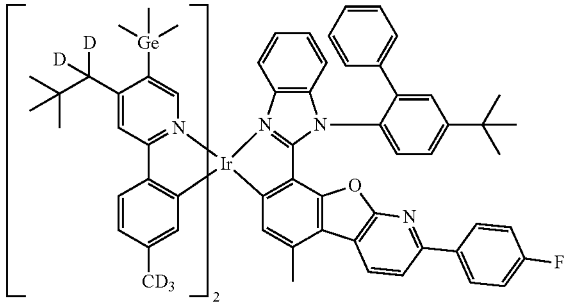
3453
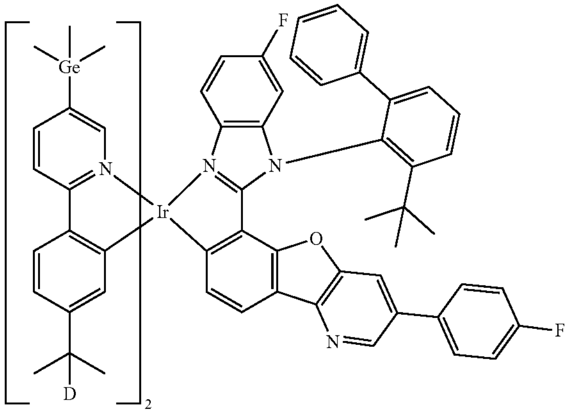
-continued
3454
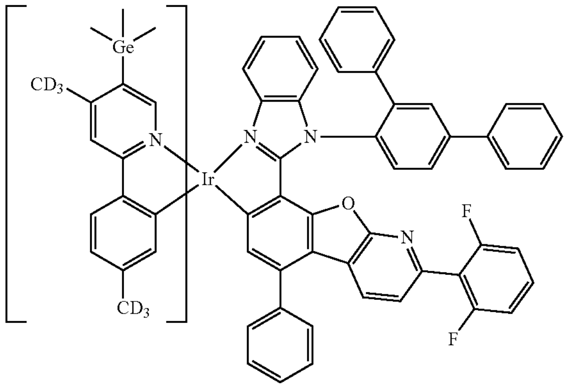
3455
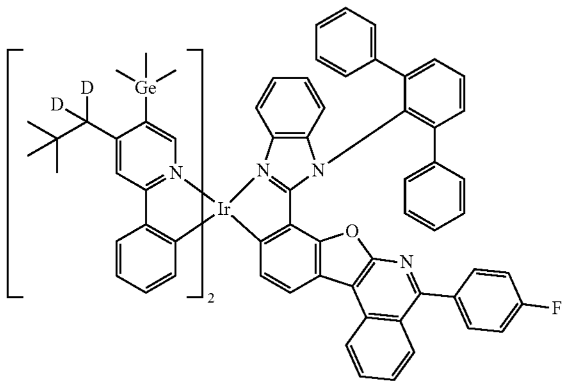
3456
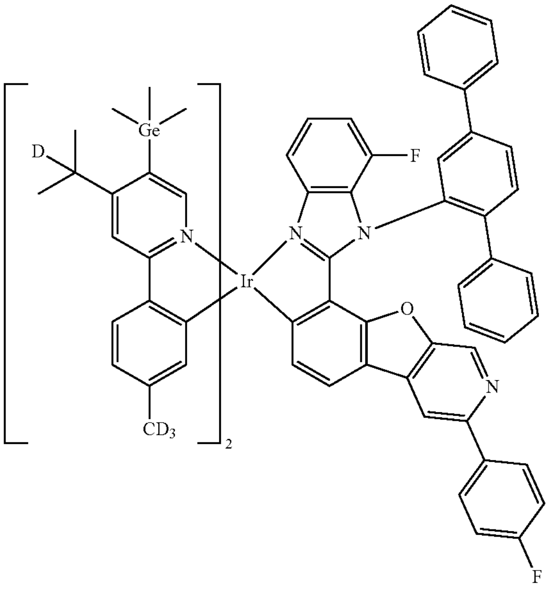

3457
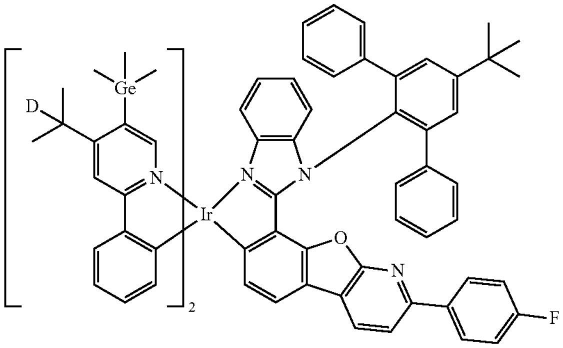
3460
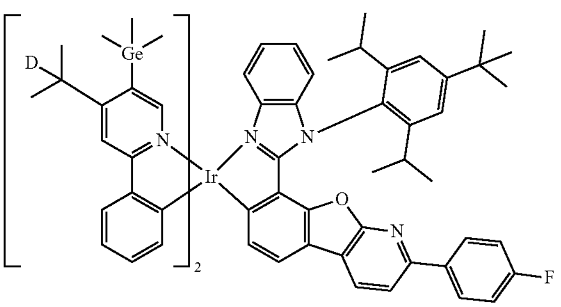
3458
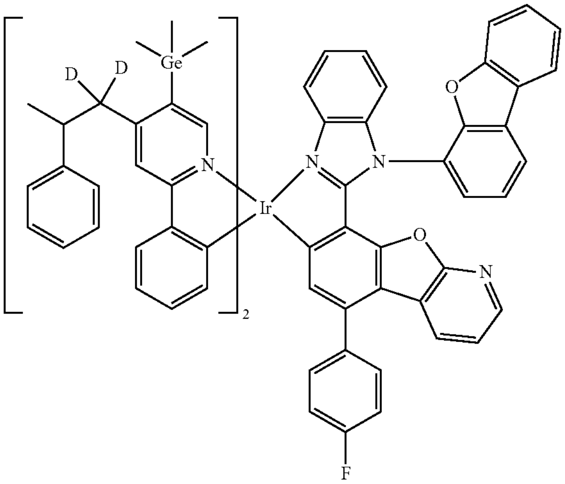
3461
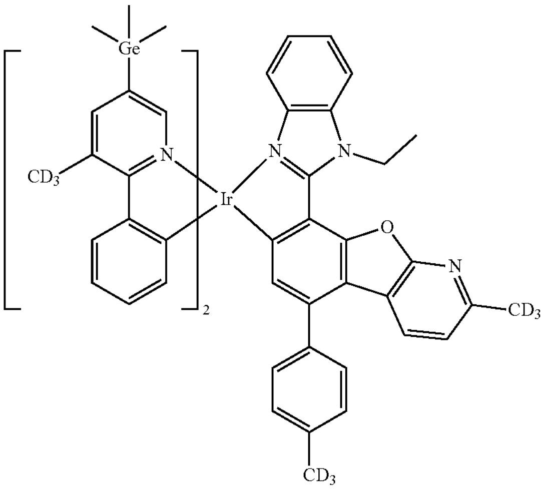
3459
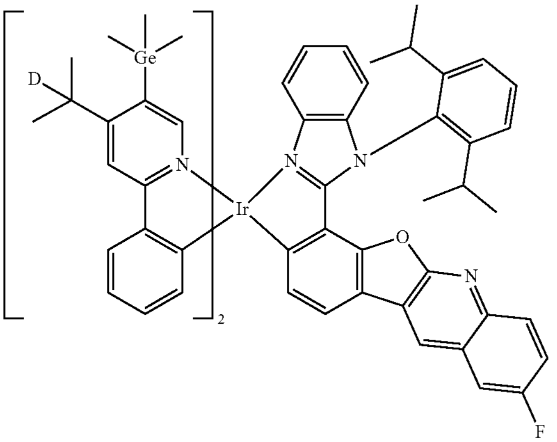
3462
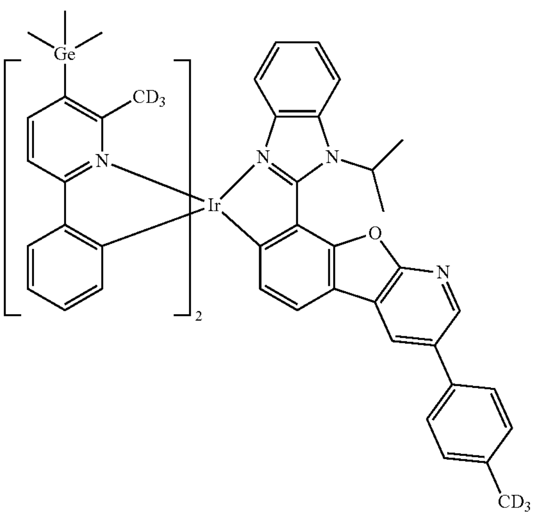

-continued
3463
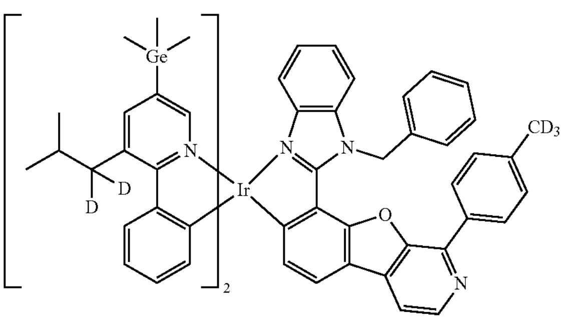
3464
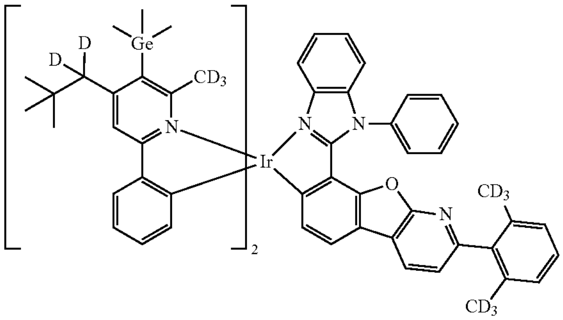
3465
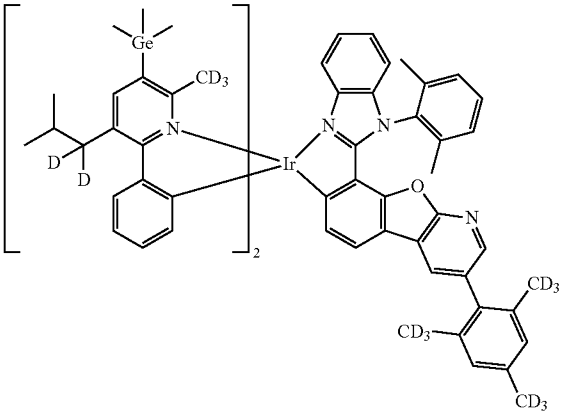
3466
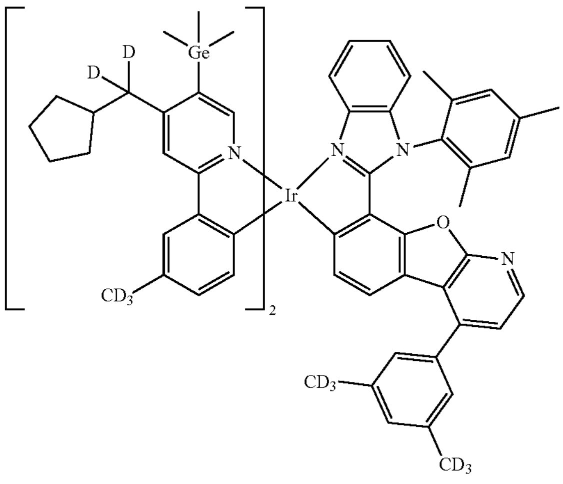
-continued
3467
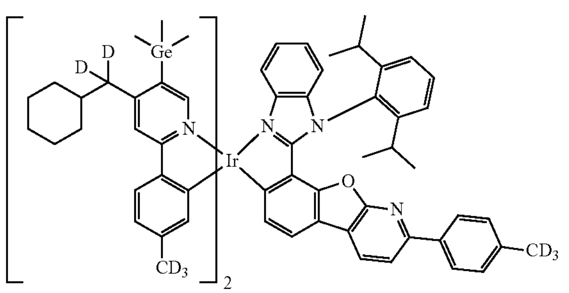
3468
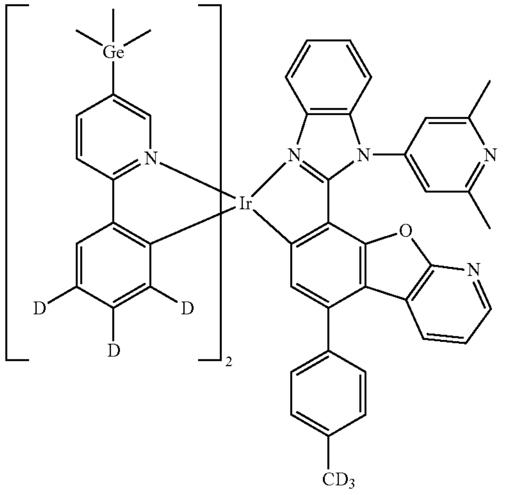
3469
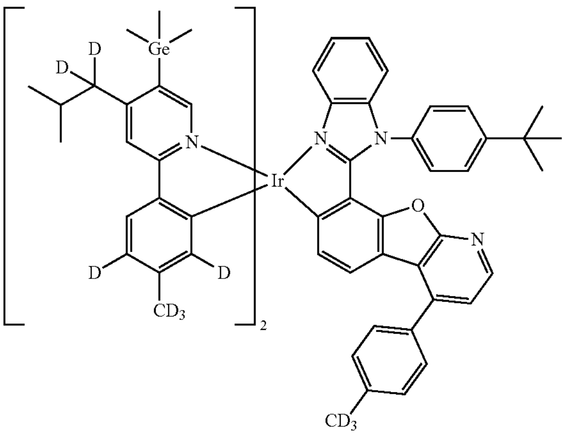

-continued
3470
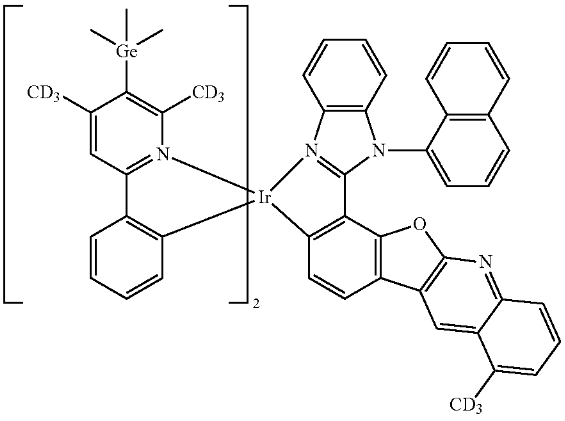
3471
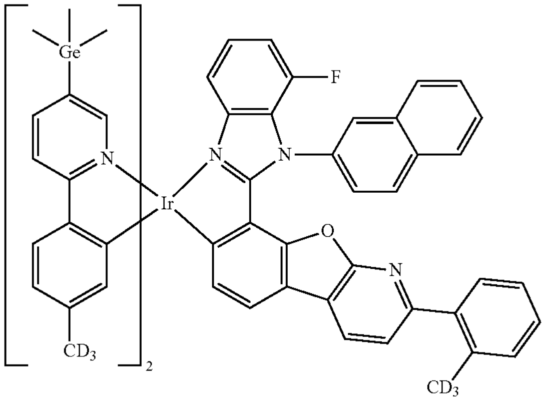
3472
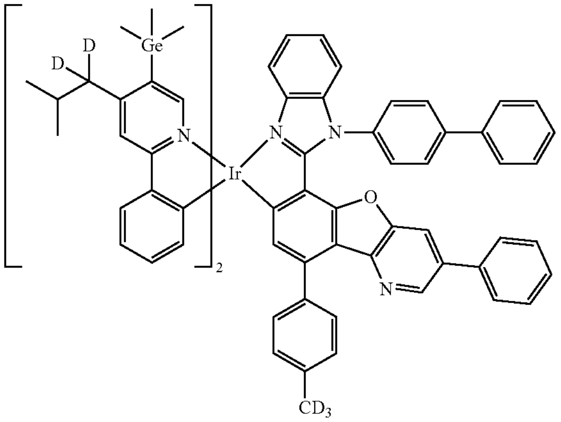
-continued
3473
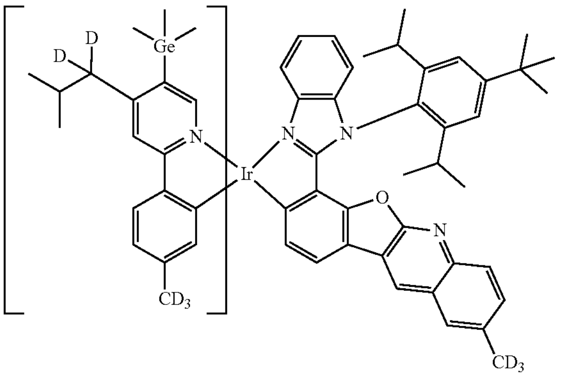
3474
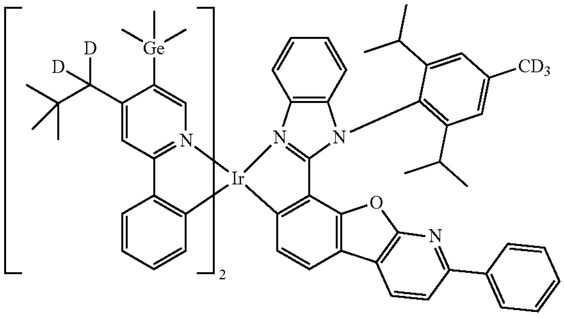
3475
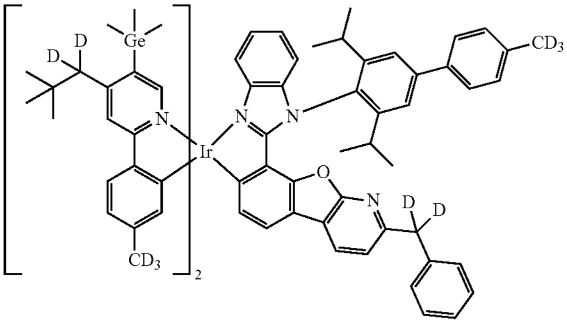
3476
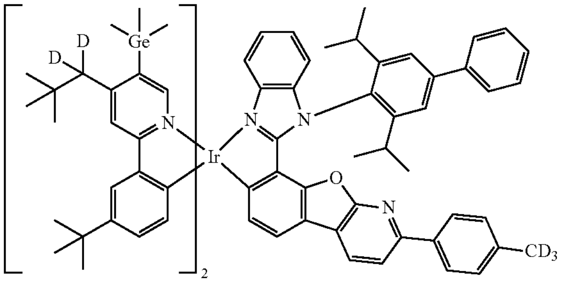

-continued
3477
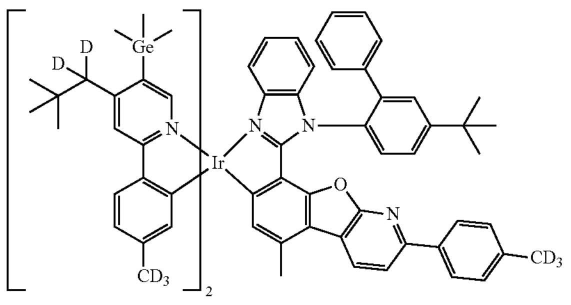
3478
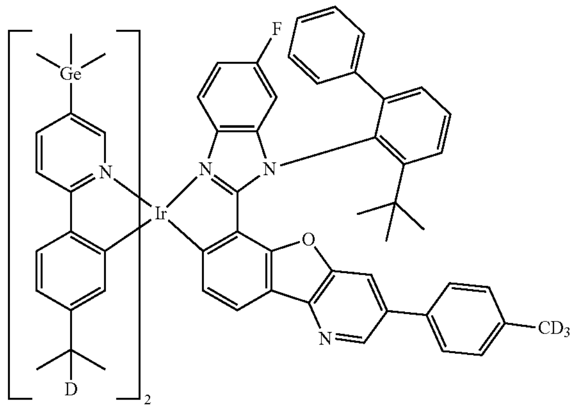
3479
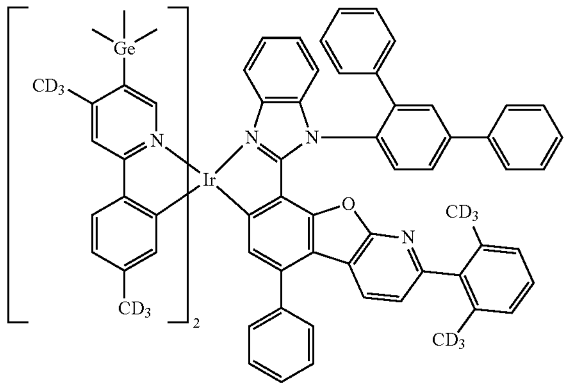
3480
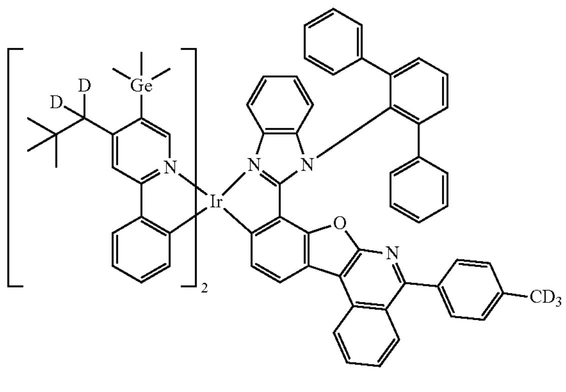
-continued
3481
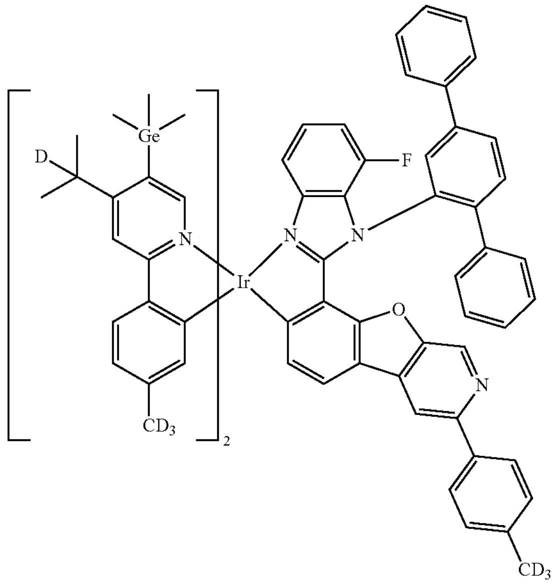
3482
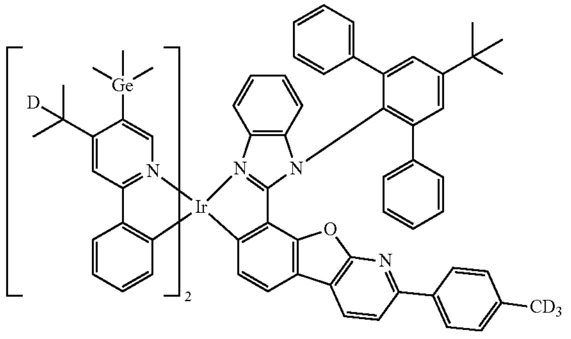
3483
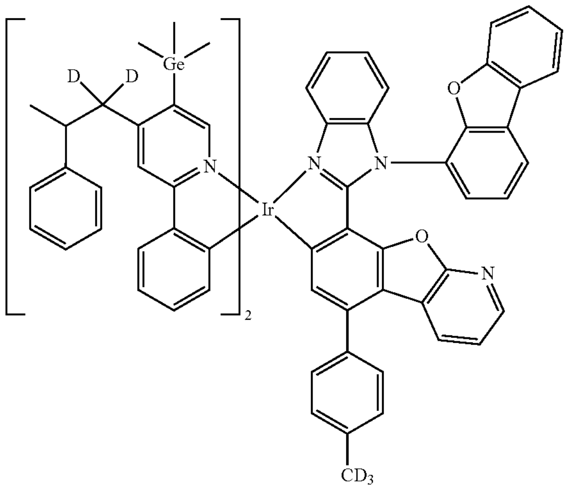

3484
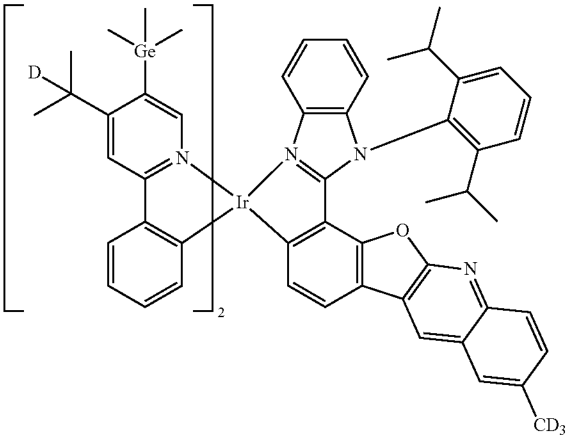
3485
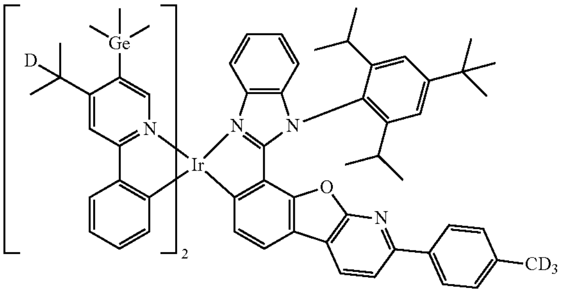
3486
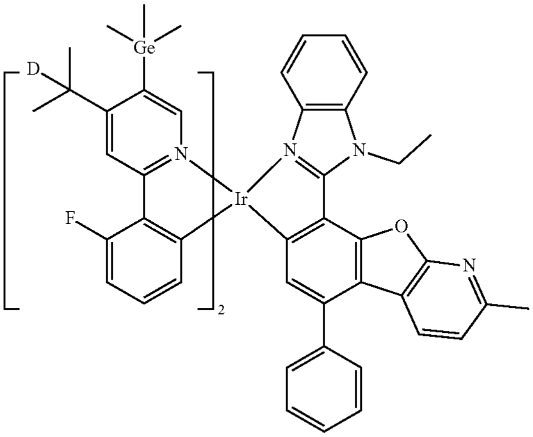
3487
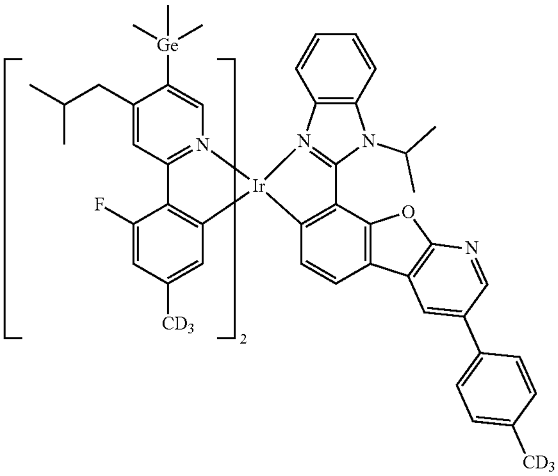
3488
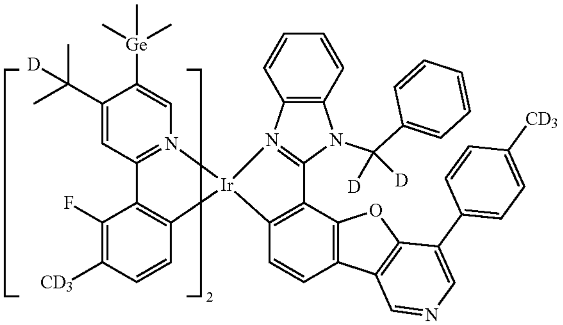
3489
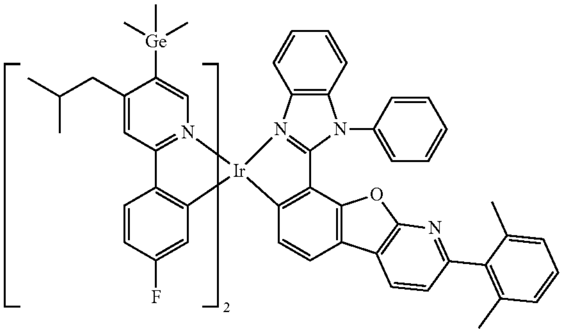

-continued
3490
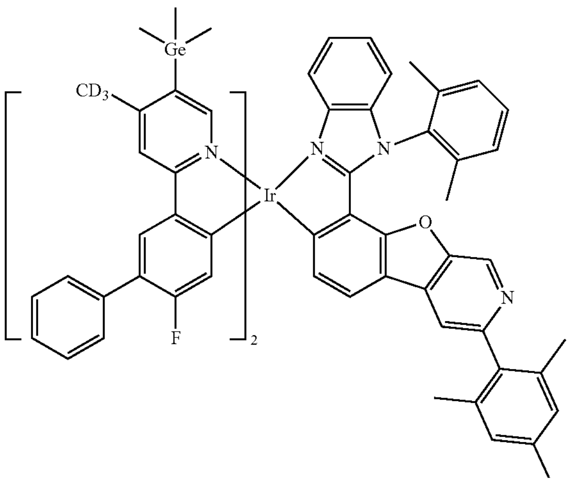
3491
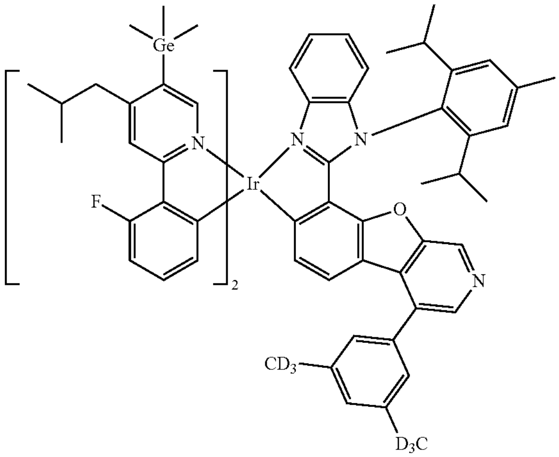
3492
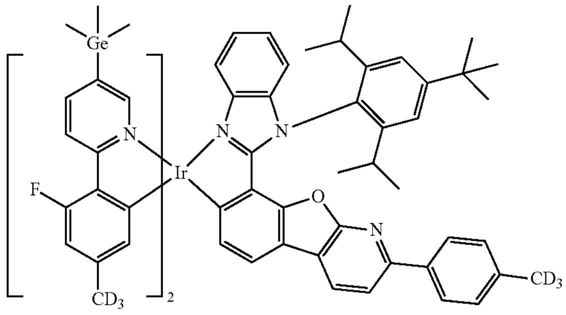
3493
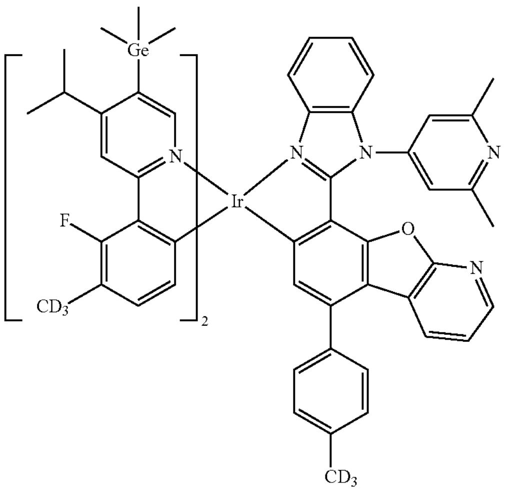
3494
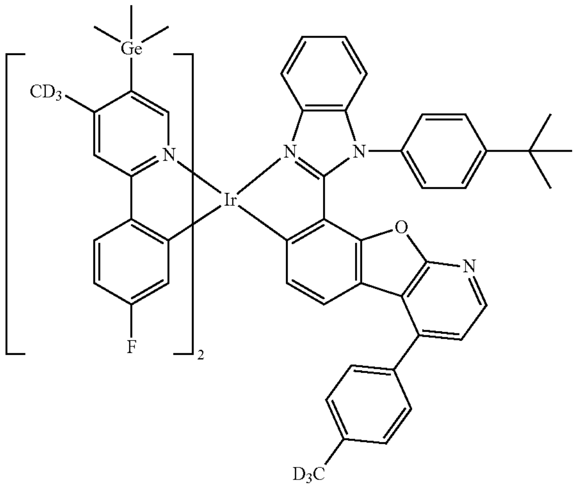
3495
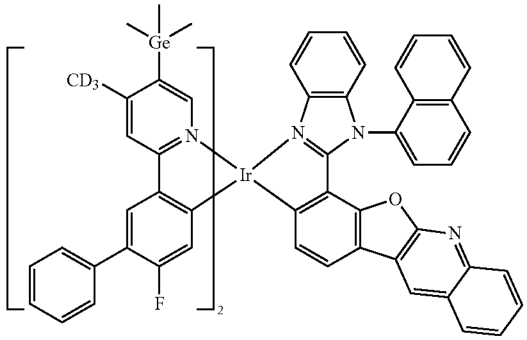

-continued
3496
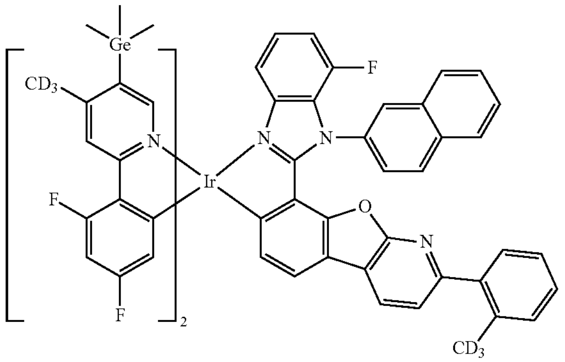
3497
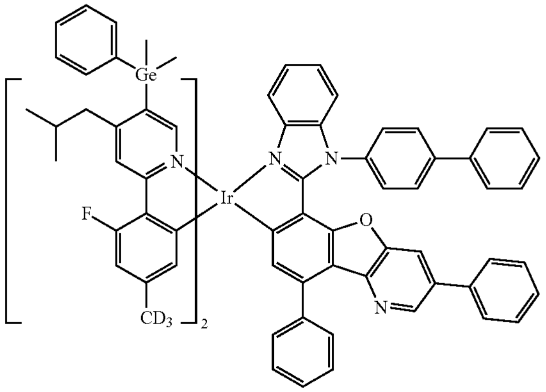
3498
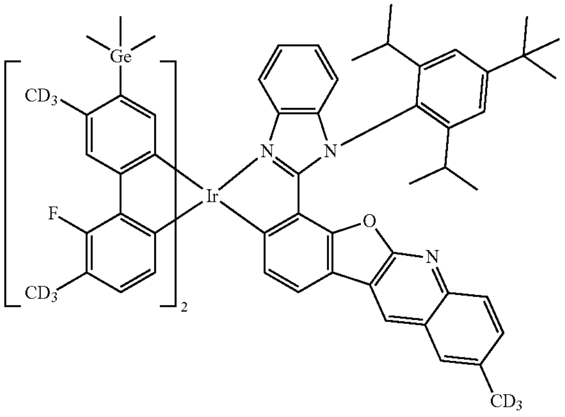
3499
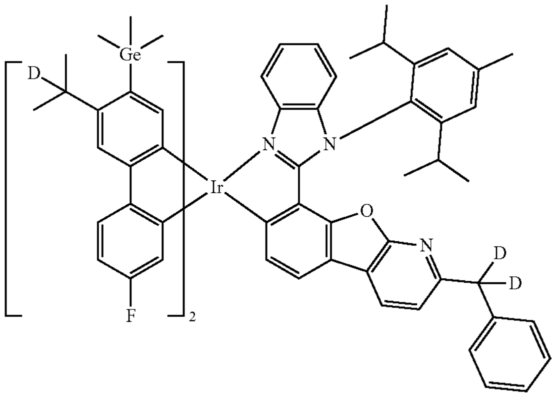
-continued
3500
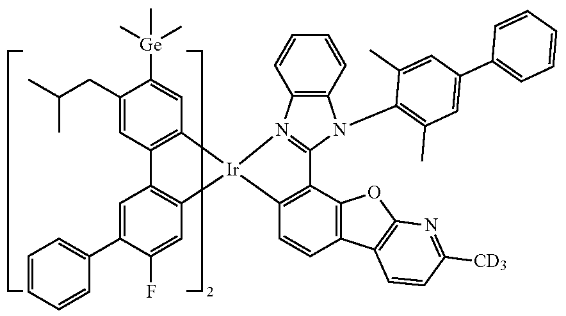
3501
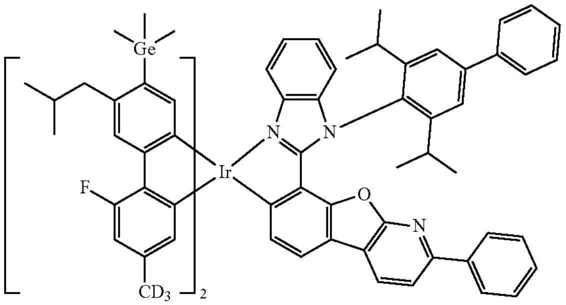
3502
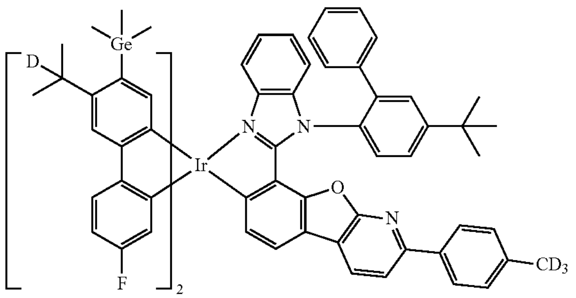
3503
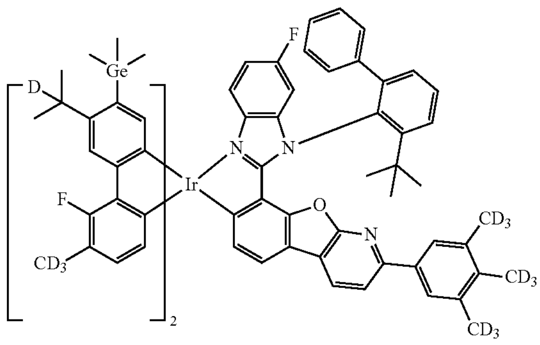

-continued
3504
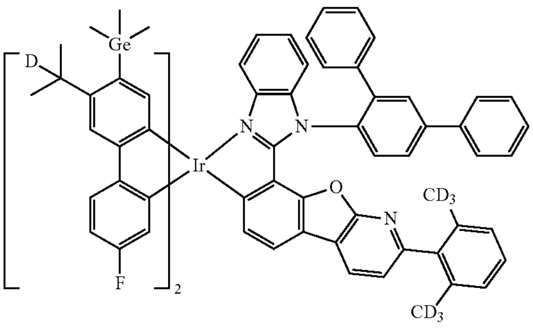
3505
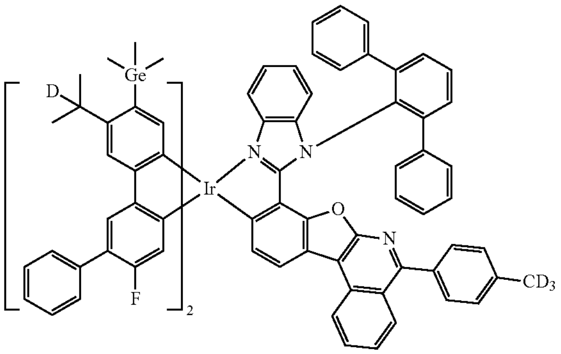
3506
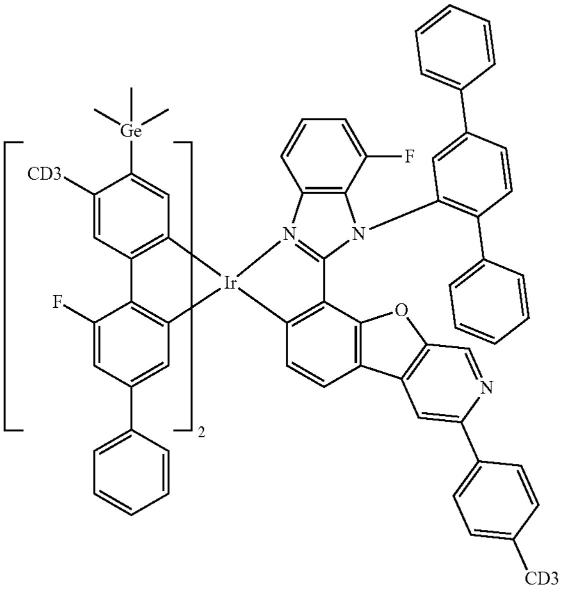
-continued
3507
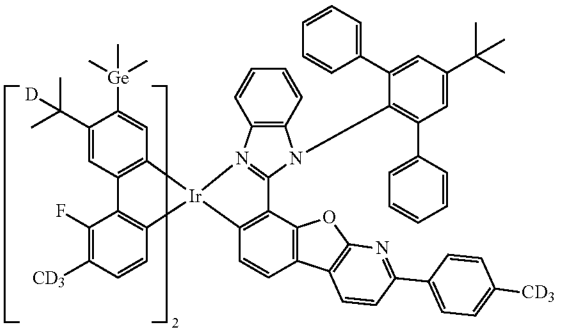
3508
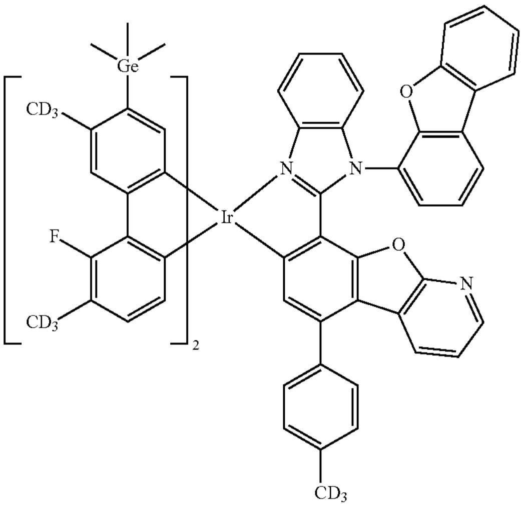
3509
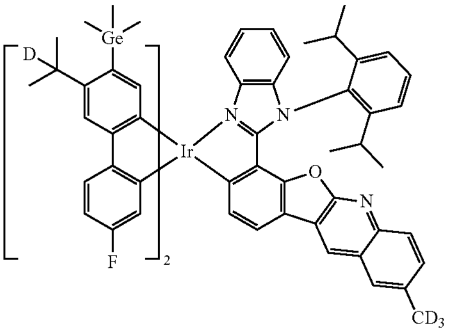
3510
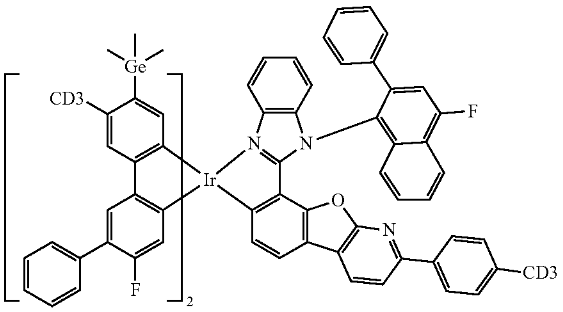

3511
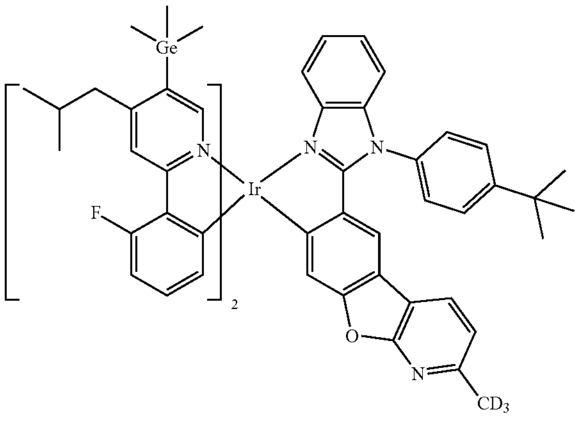
3512
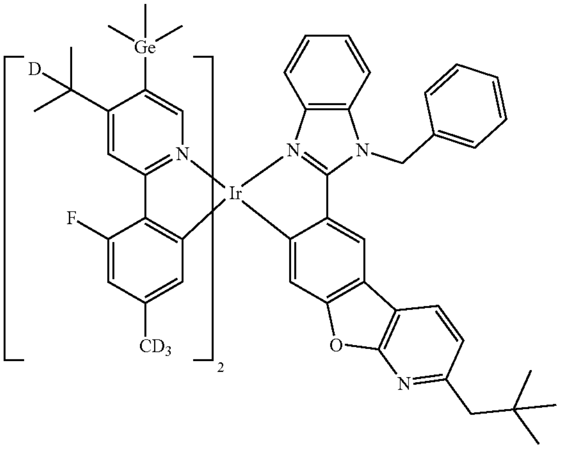
3513
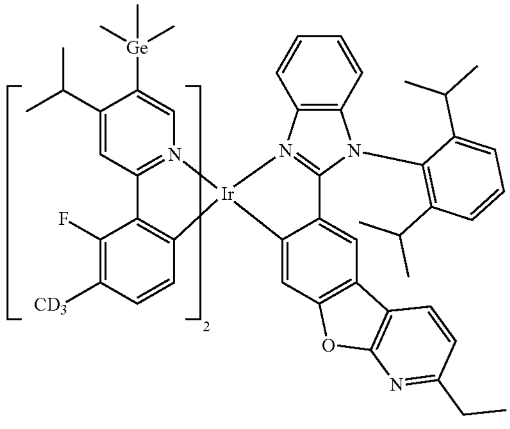
-continued
3514
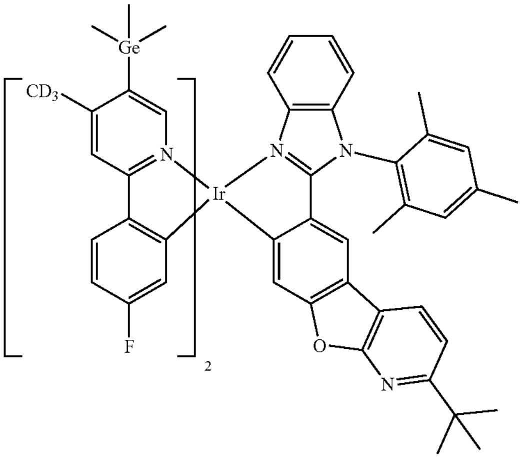
3515
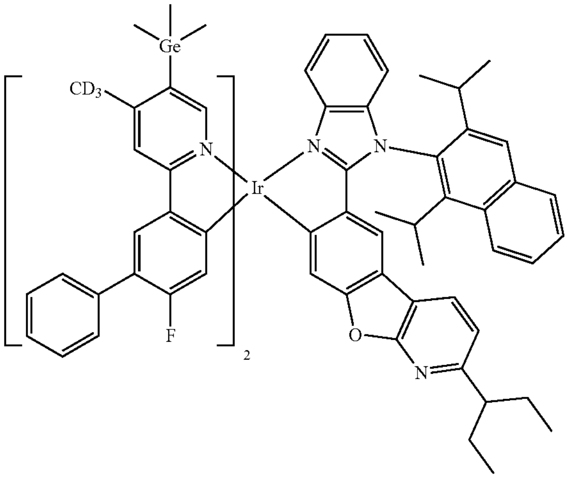
3516
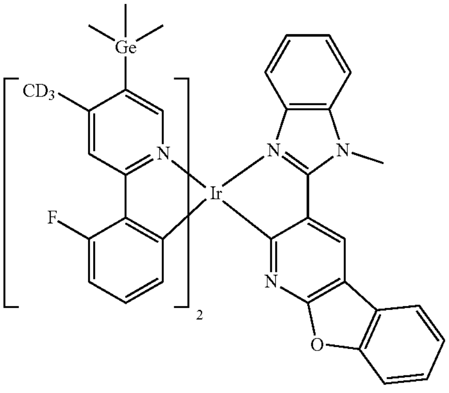

-continued
3517
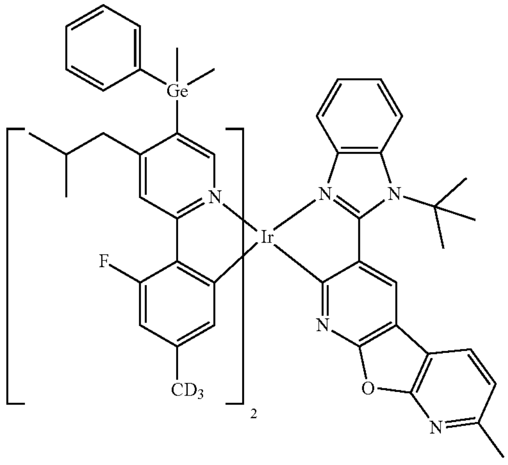
3518
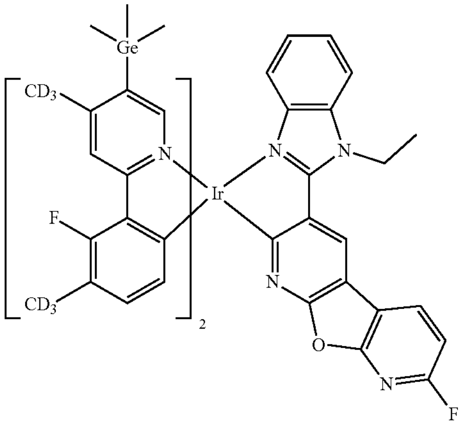
3519
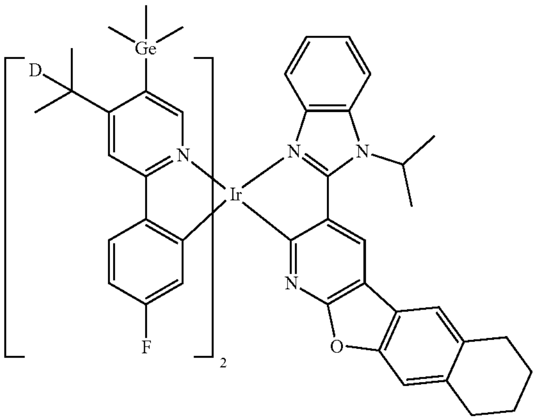
-continued
3520
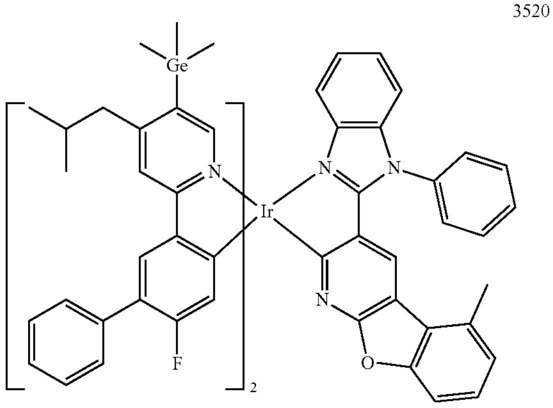
3521
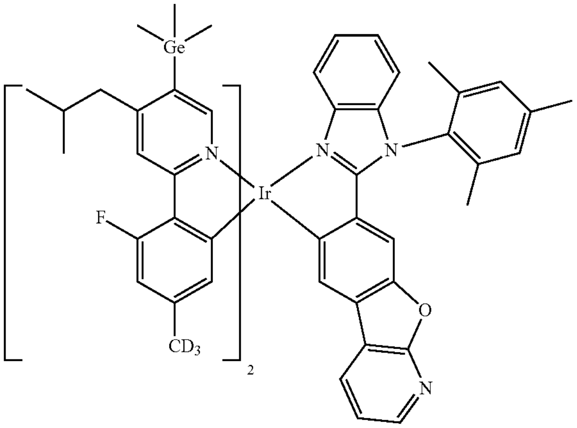
3522
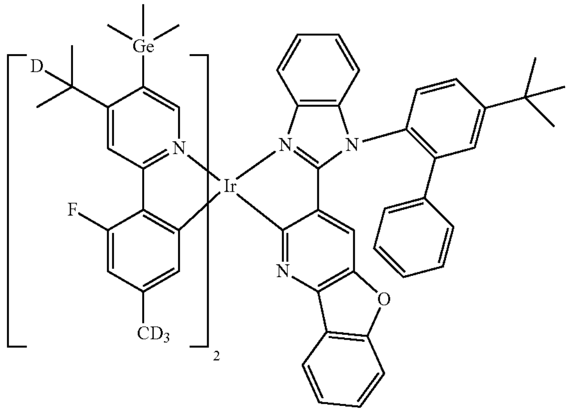

-continued
3523
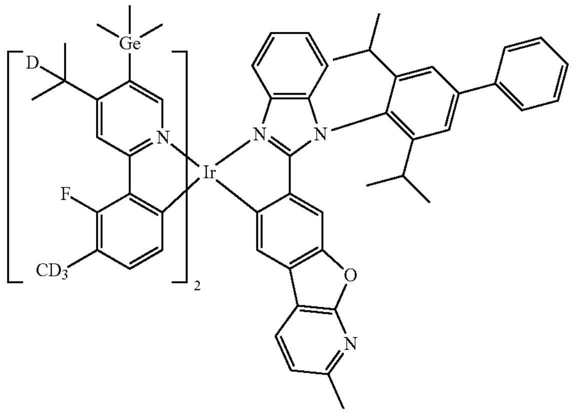
3524
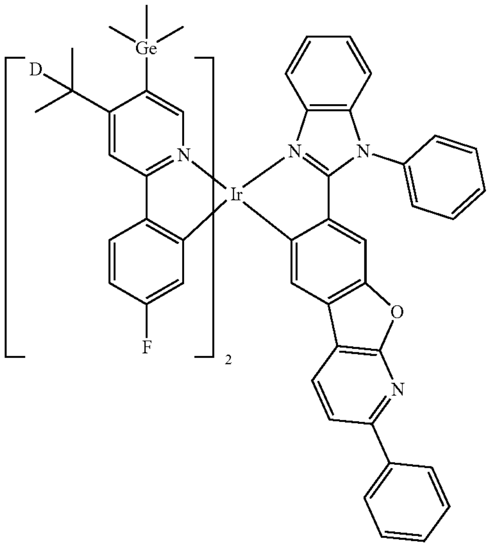
3525
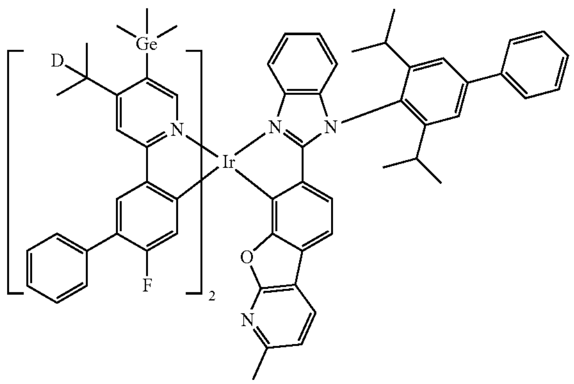
-continued
3526
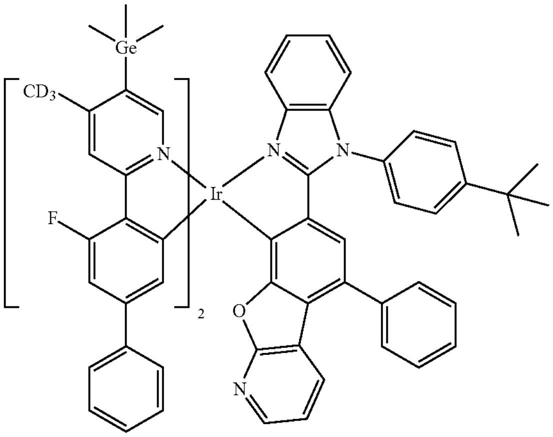
3527
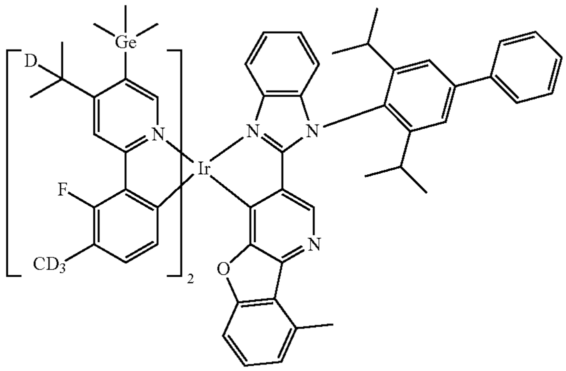
3528
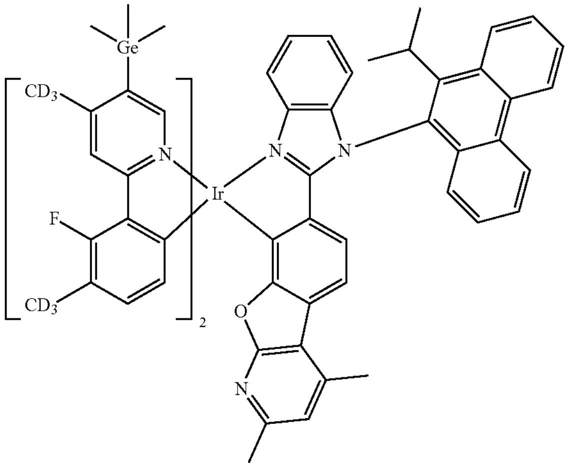

-continued
3529
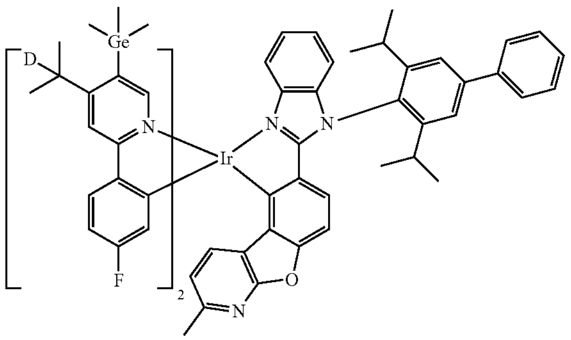
3530
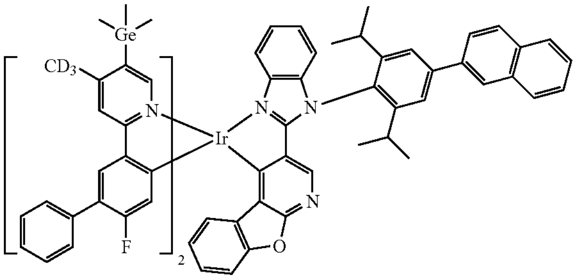
3531
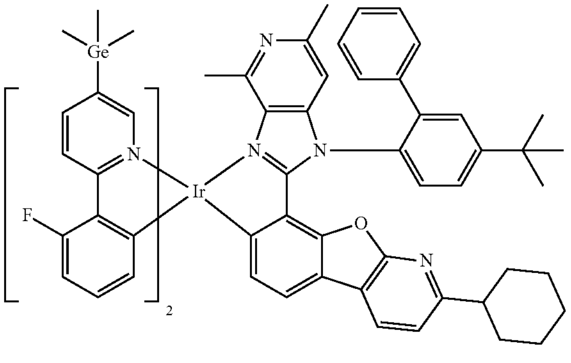
3532
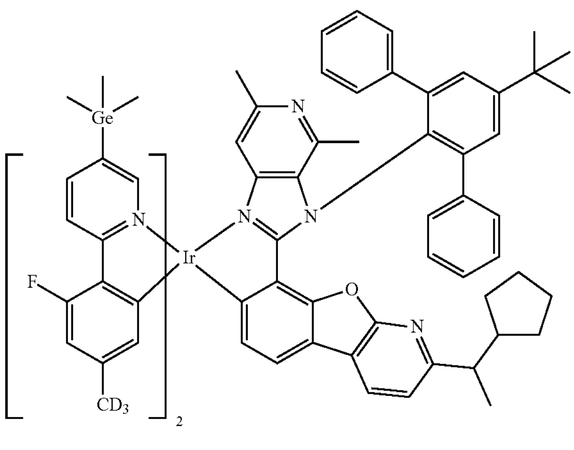
-continued
3533
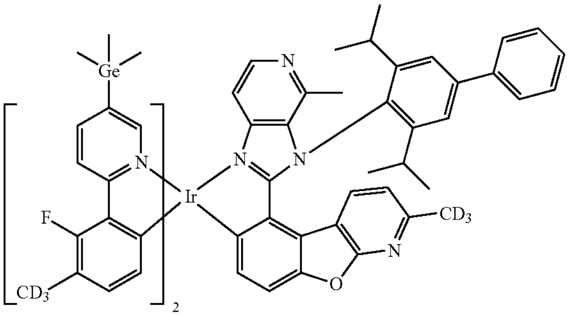
3534
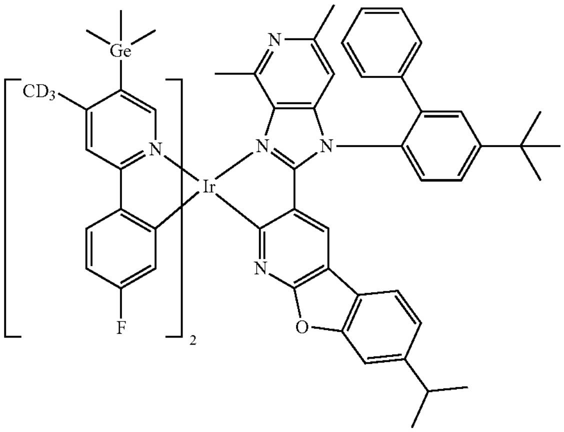
3535
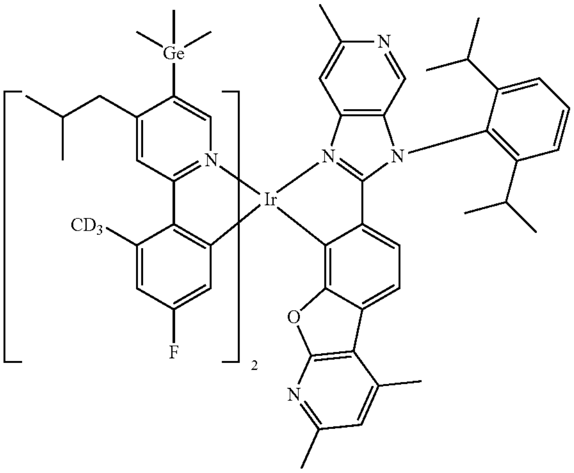
3536
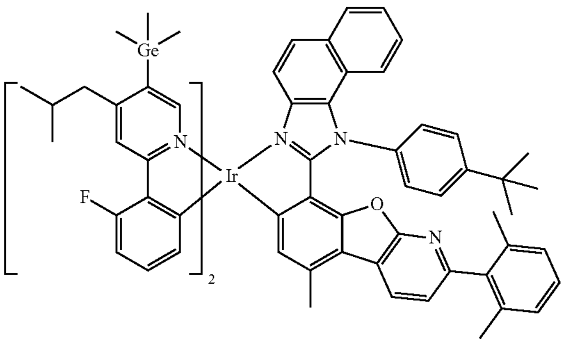

-continued
3537
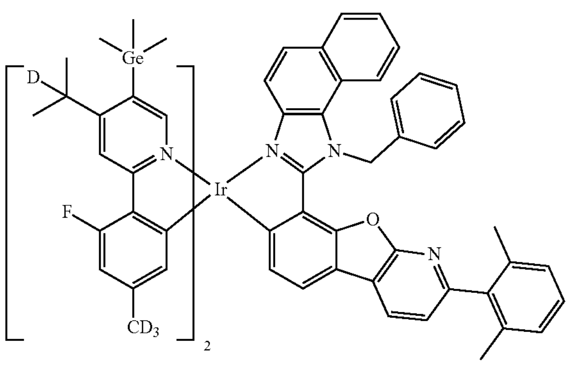
3538
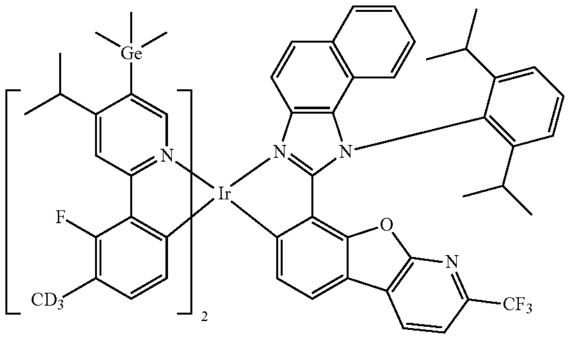
3539
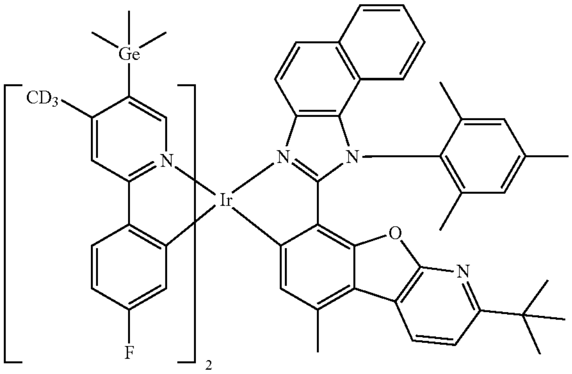
3540
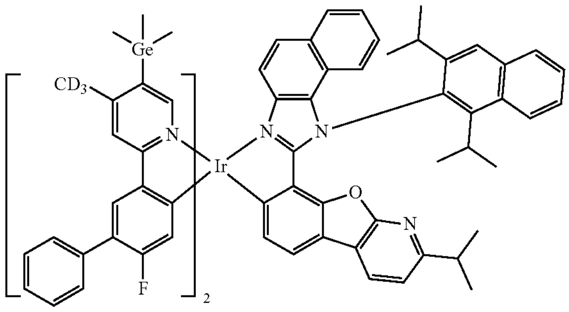
-continued
3541
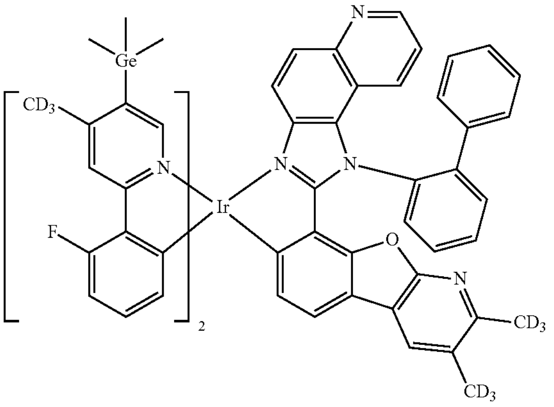
3542
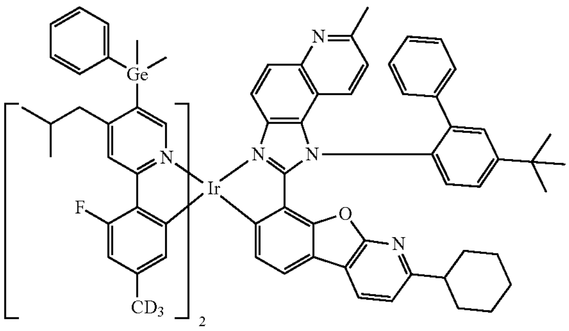
3543
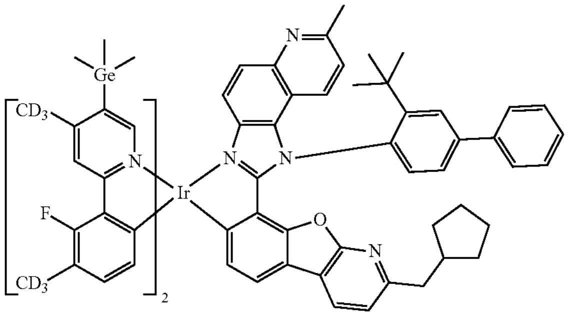
3544
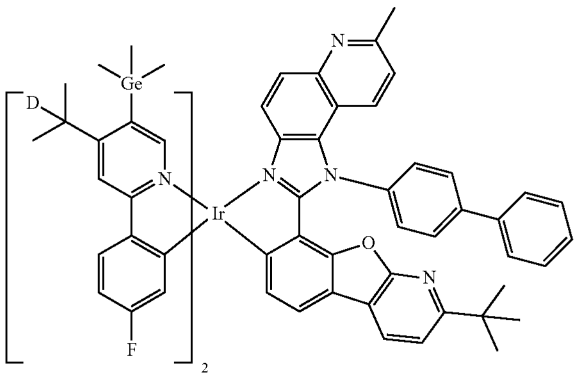

-continued
3545
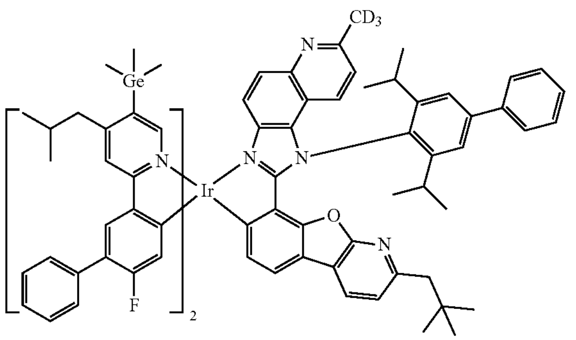
3546
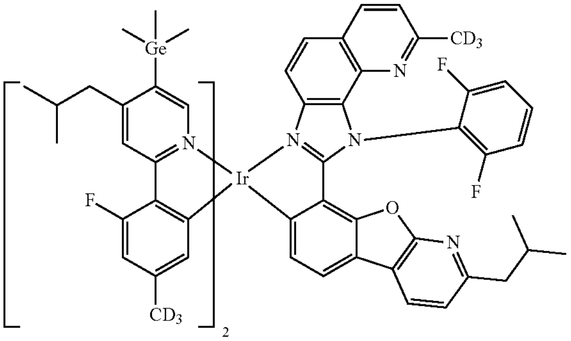
3547
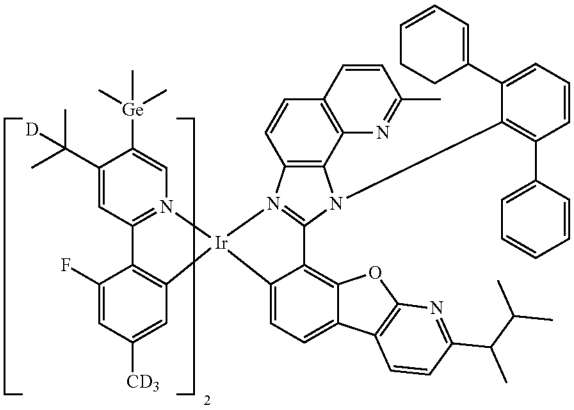
3548
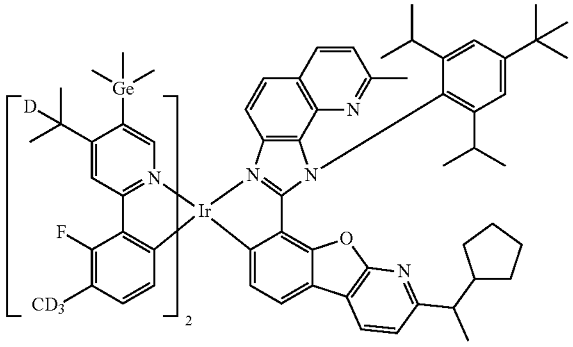
-continued
3549
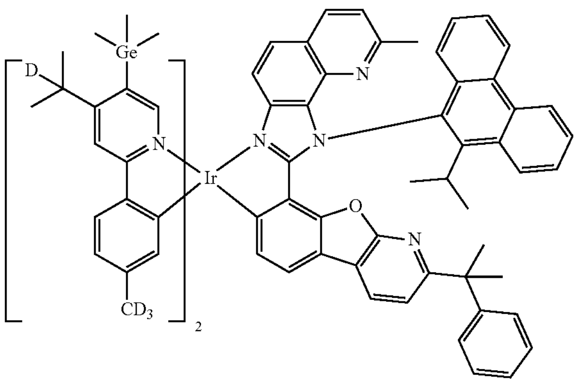
3550
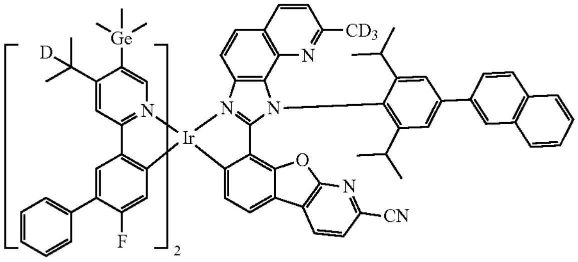
3551
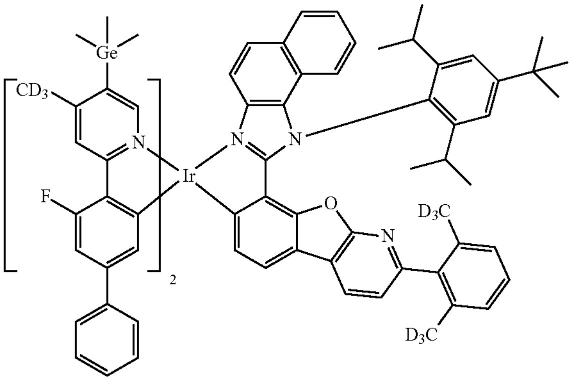
3552
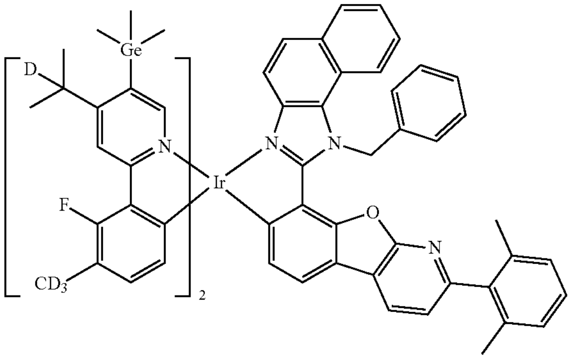

-continued
3553
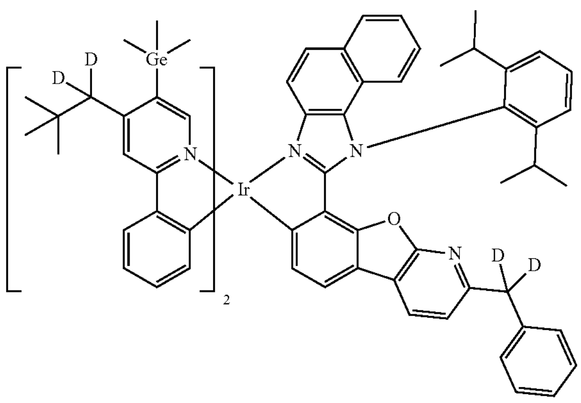
3554
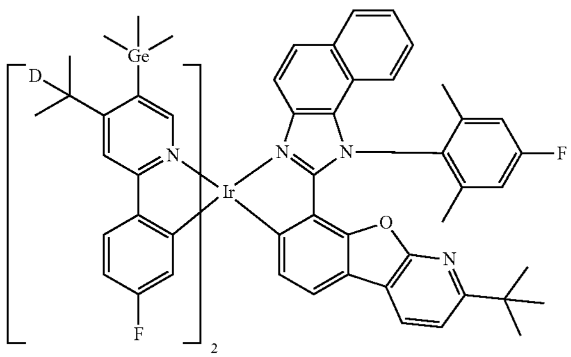
3555
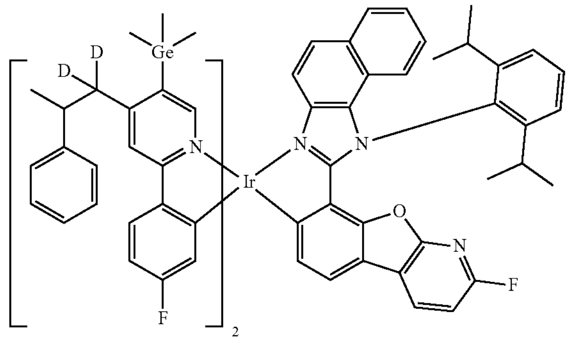
3556
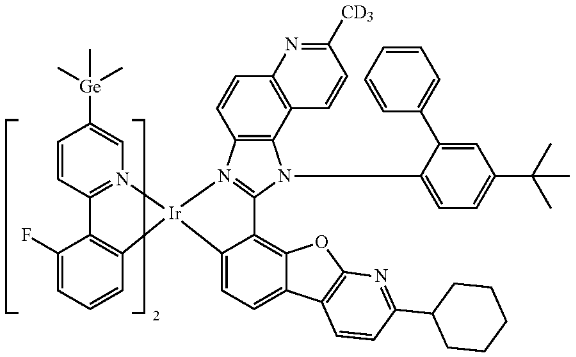
-continued
3557
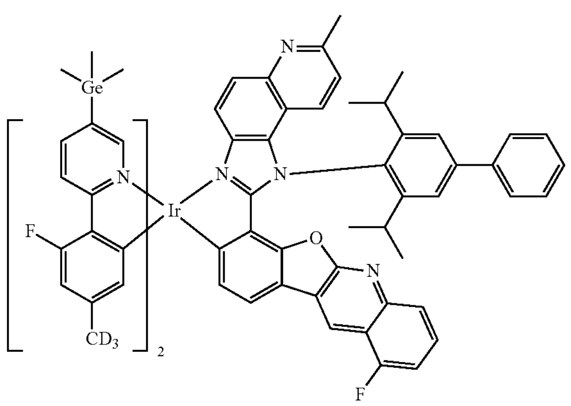
3558
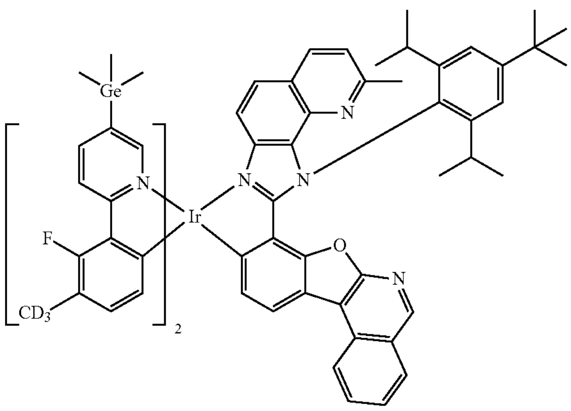
3559
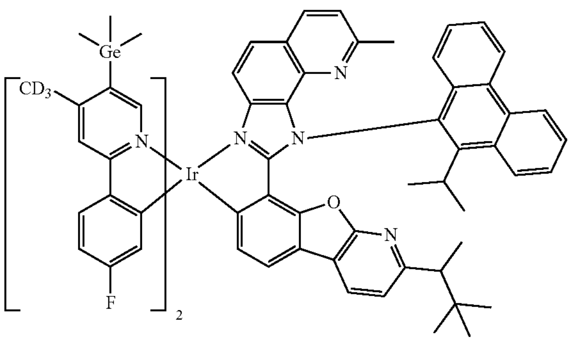
3560
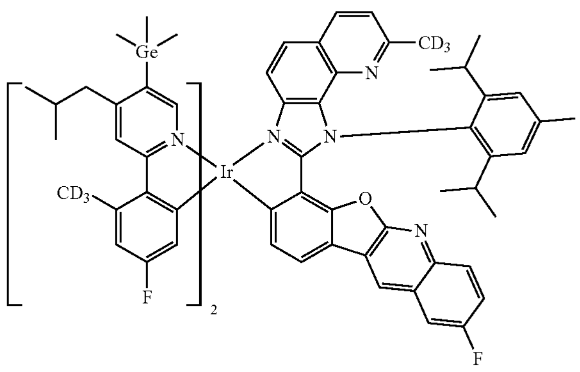

-continued
3561
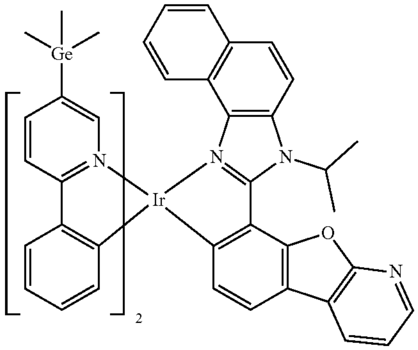
3562
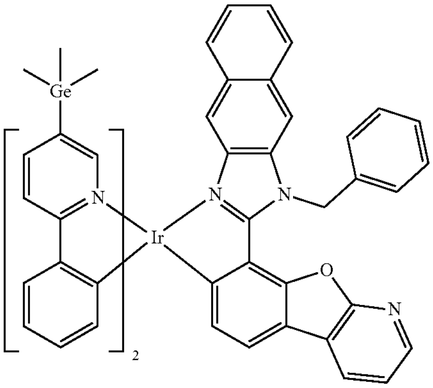
3563
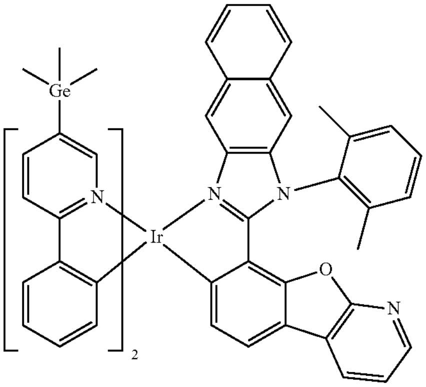
3564
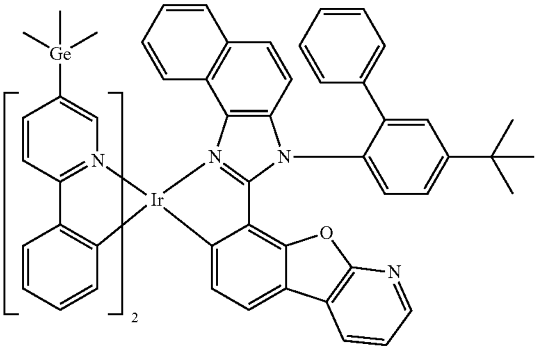
-continued
3565
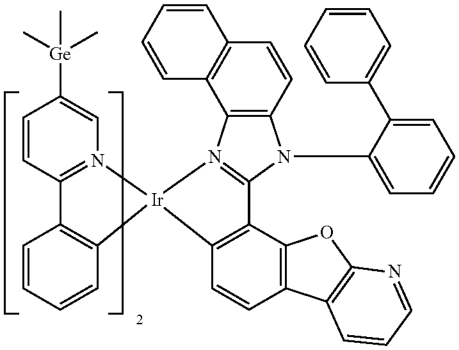
3566
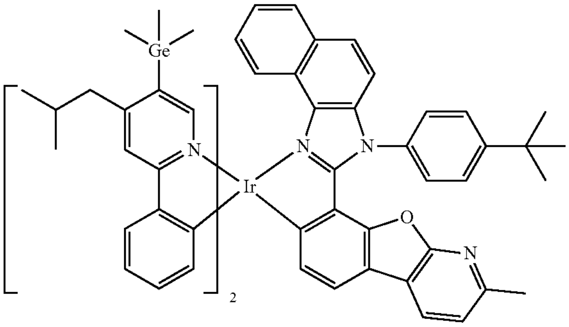
3567
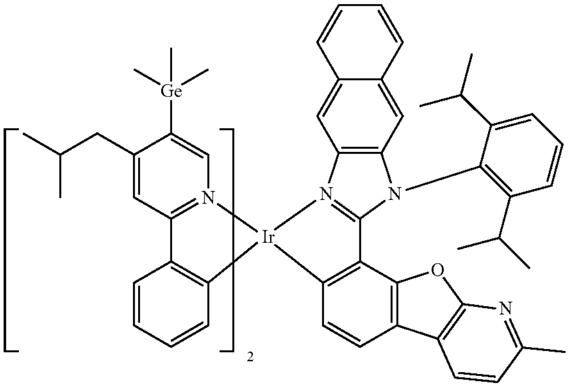
3568
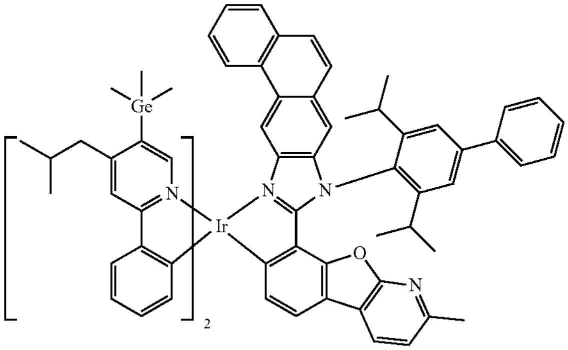

-continued
3569
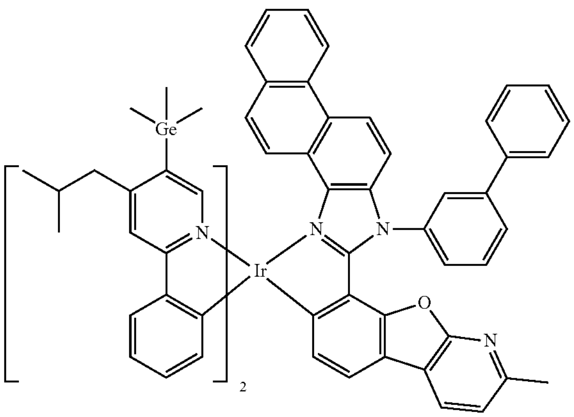
3570
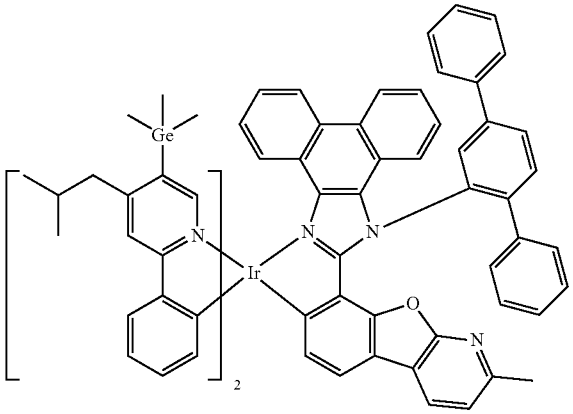
3571
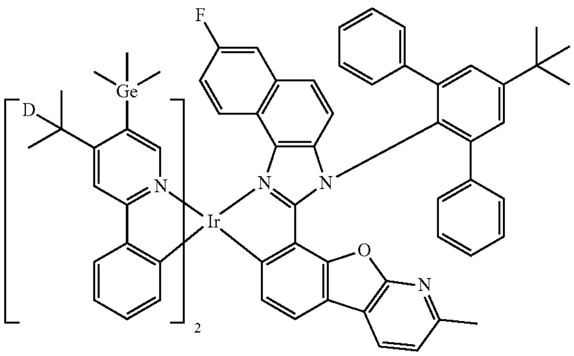
3572
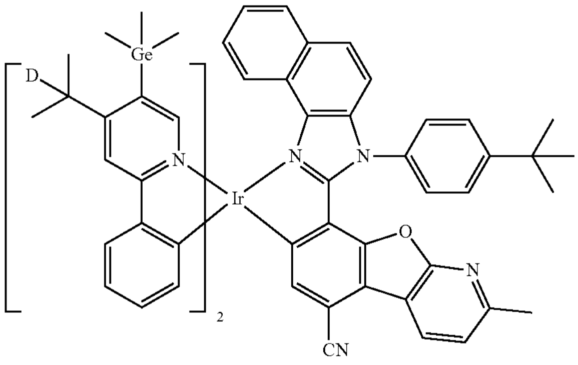
-continued
3573
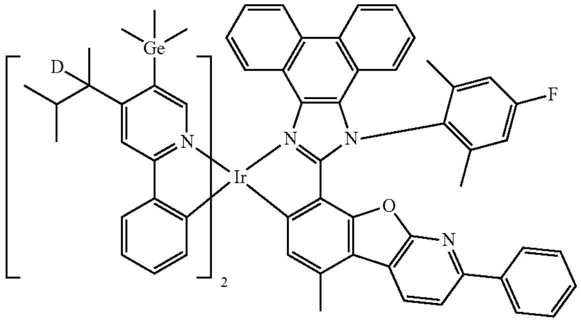
3574
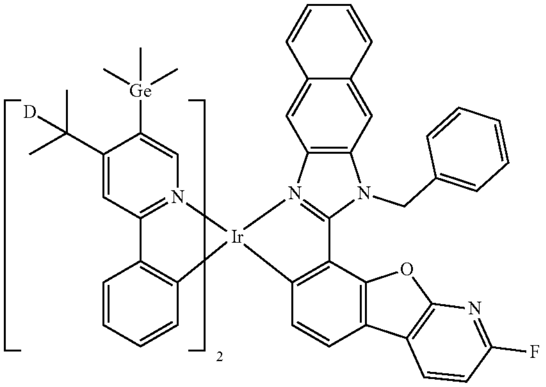
3575
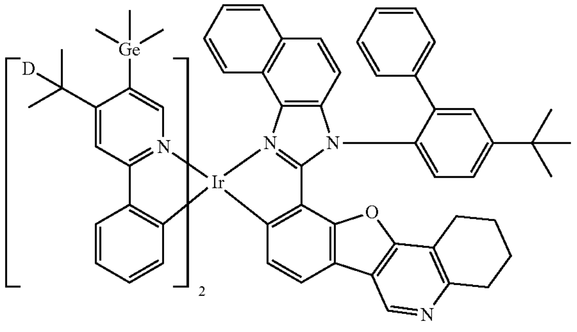
3576
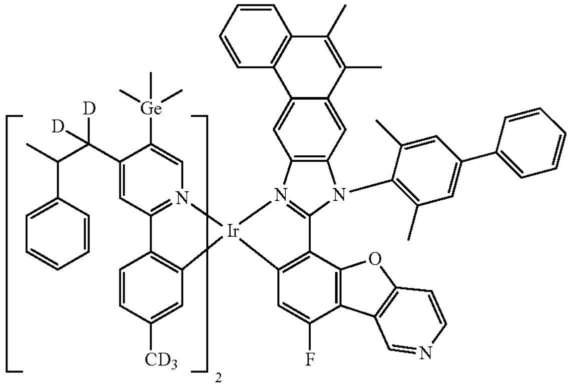

-continued
3577
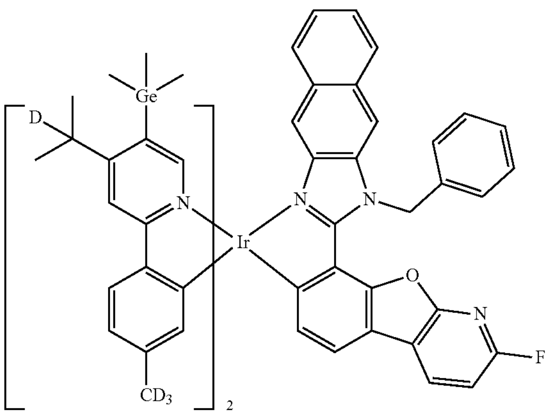
3578
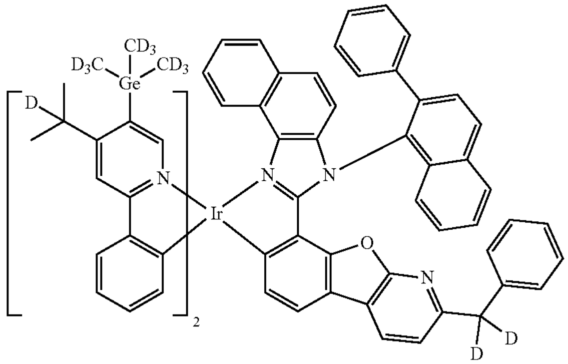
3579
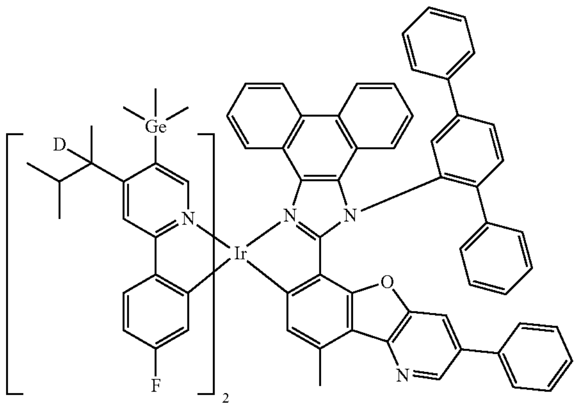
3580
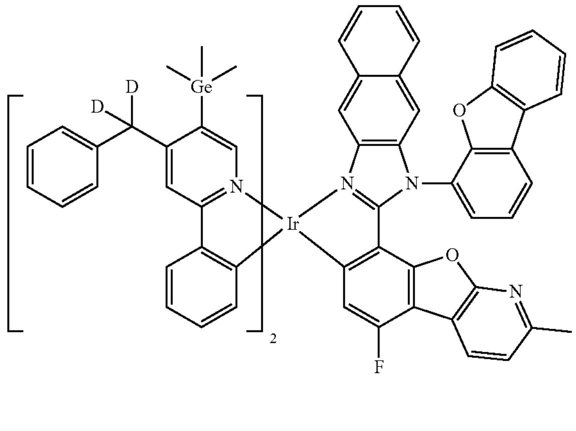
-continued
3581
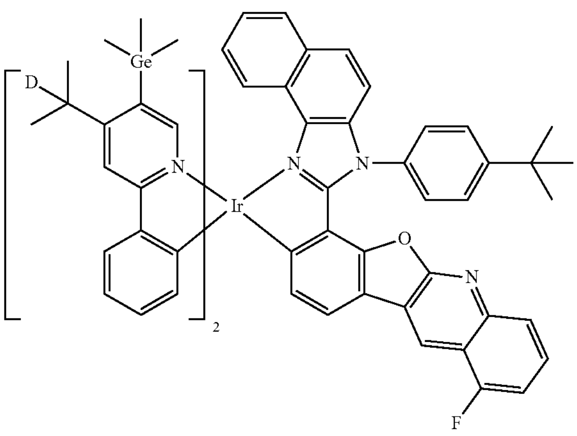
3582
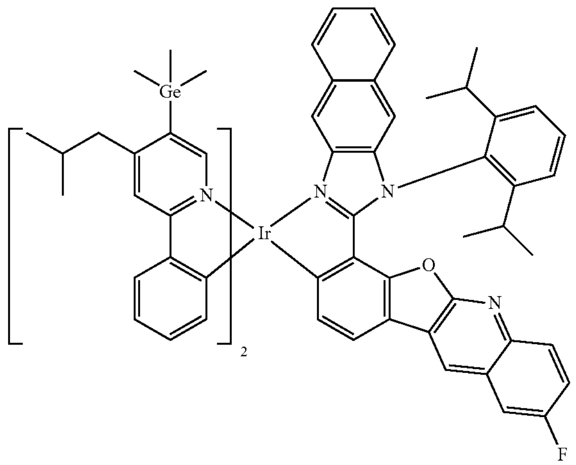
3583
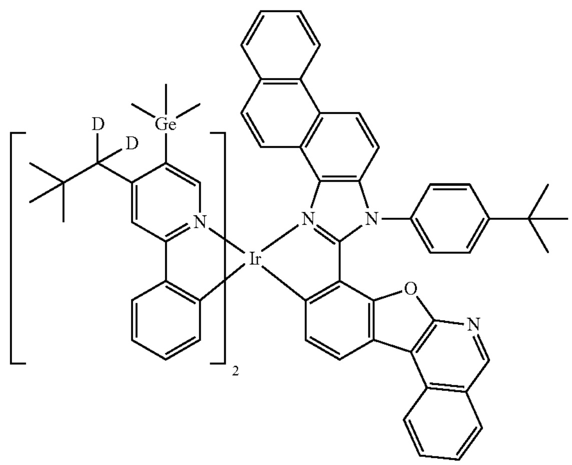

-continued
3584
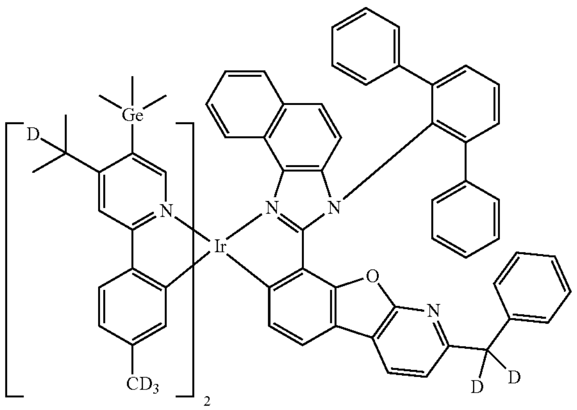
3585
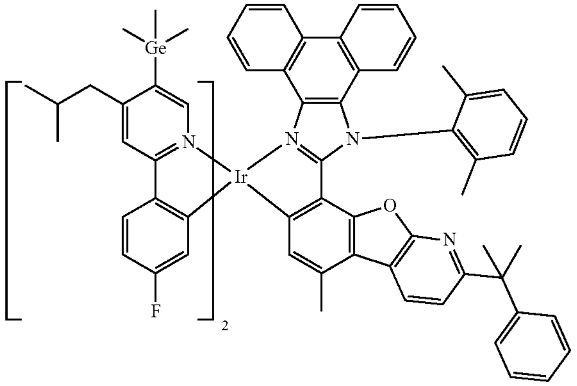
3586
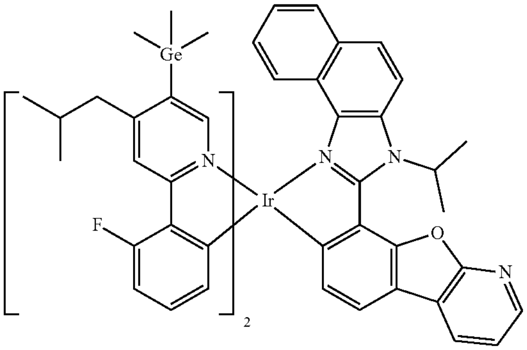
3587
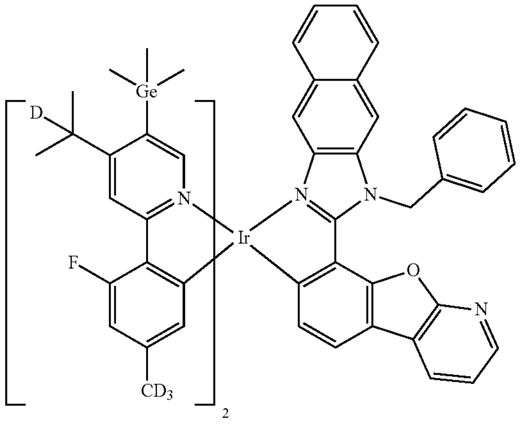
-continued
3588
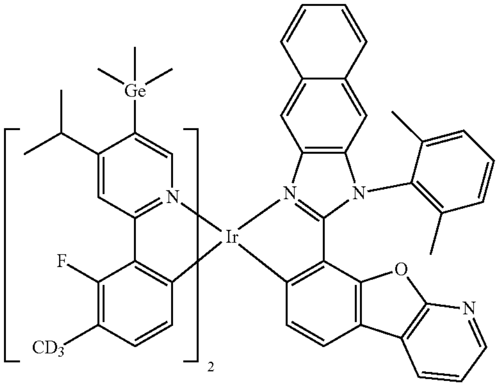
3589
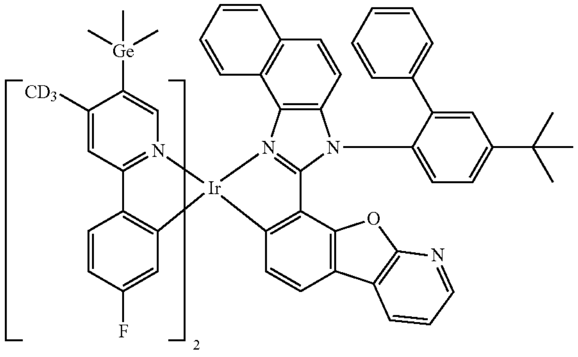
3590
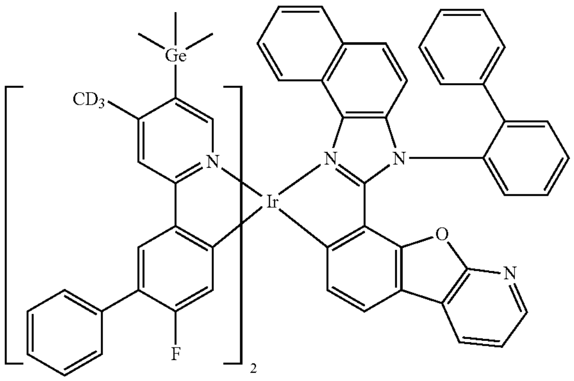
3591
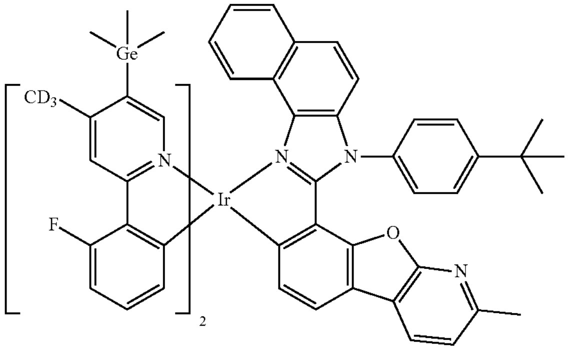

-continued
3592
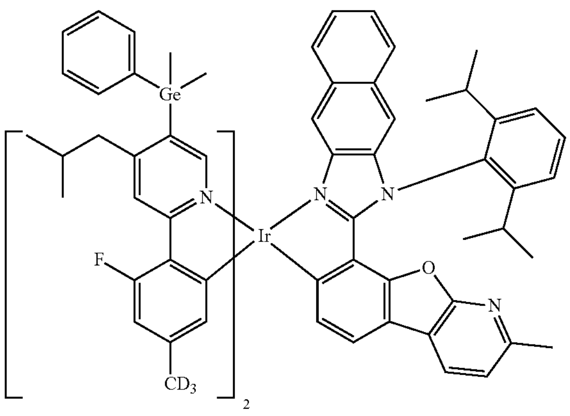
3593
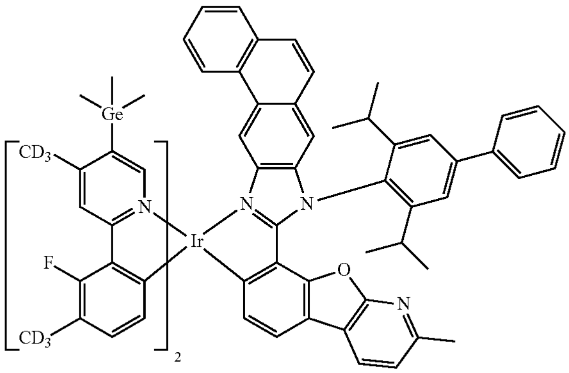
3594
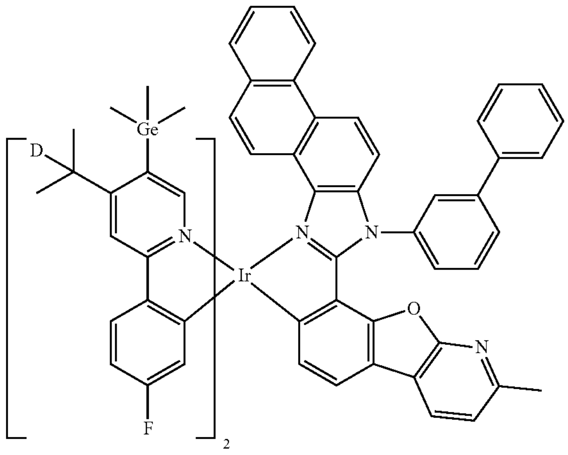
-continued
3595
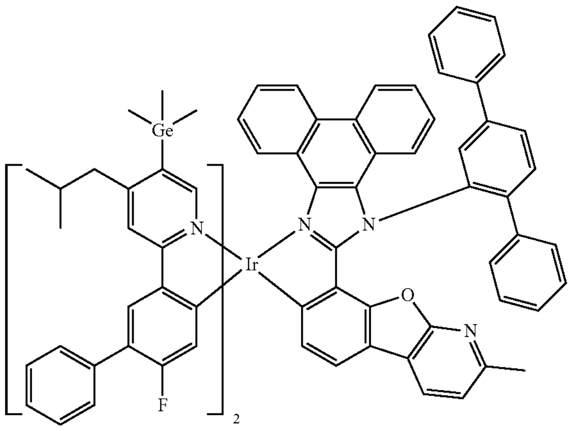
3596
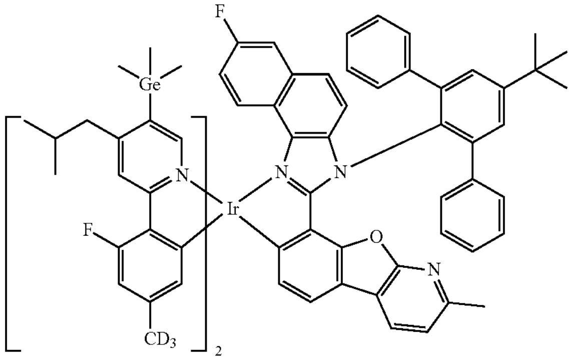
3597
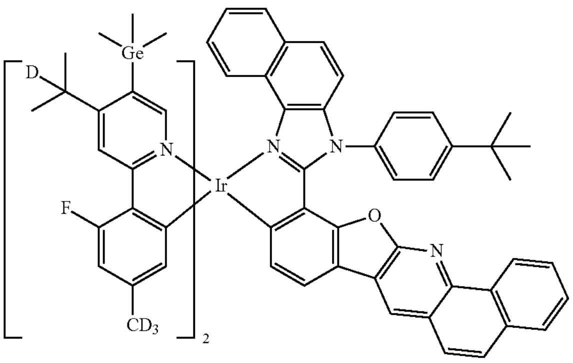
3598
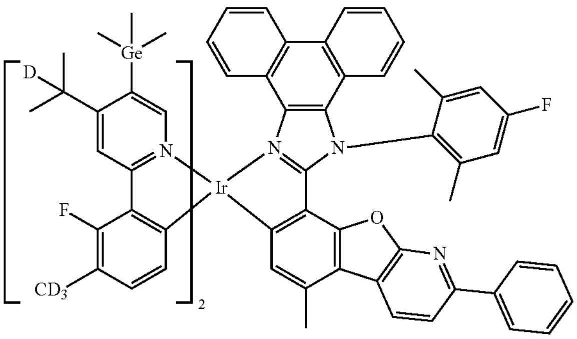

3599
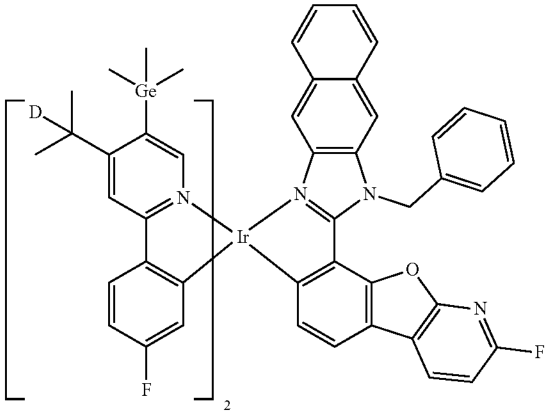
3600
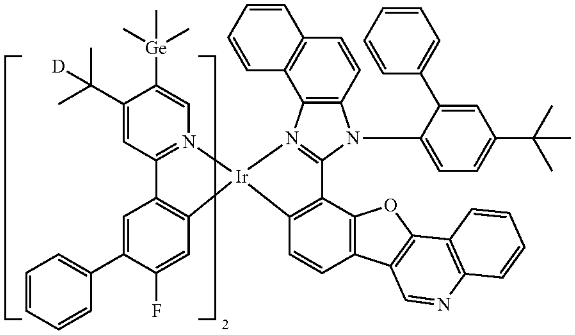
3601
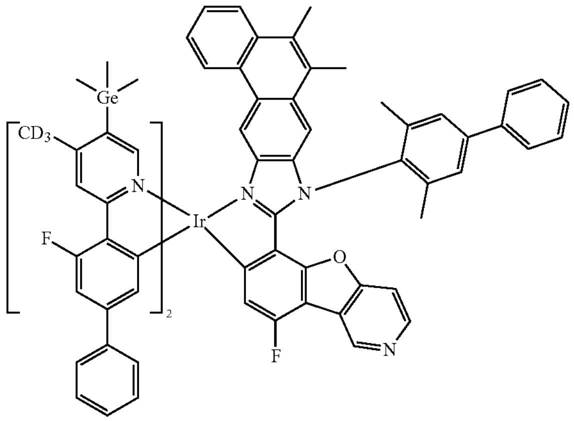
3602
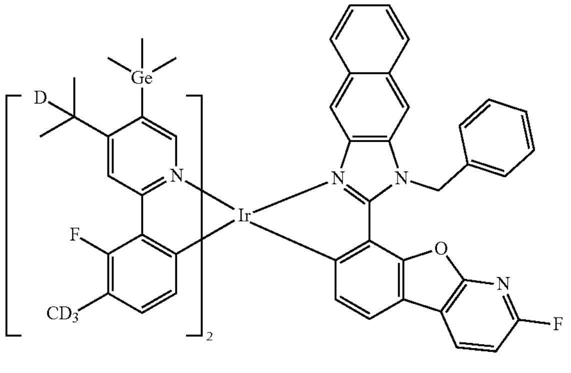
3603
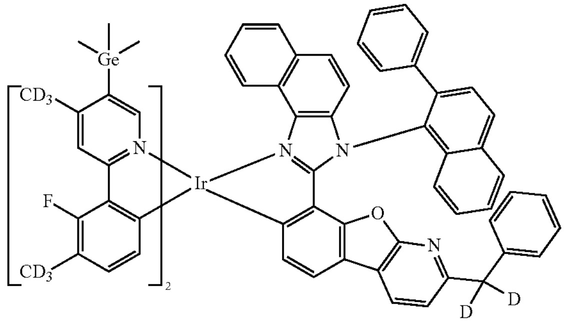
3604
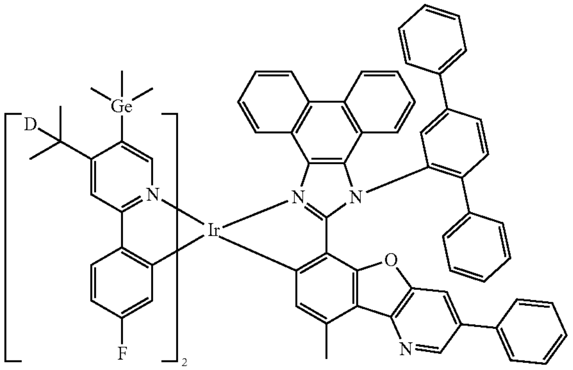
3605
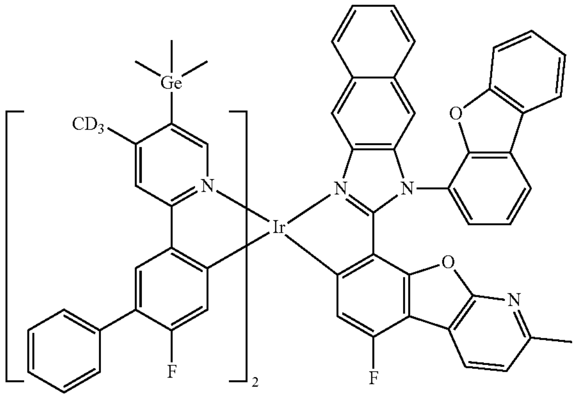

-continued
3606
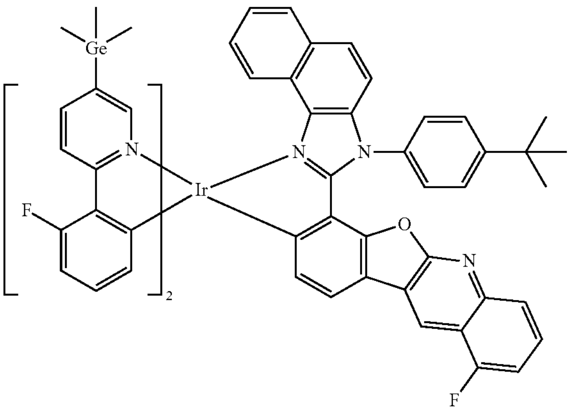
3607
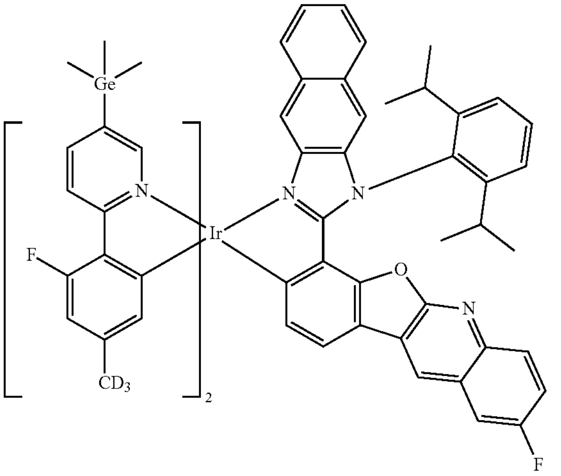
3608
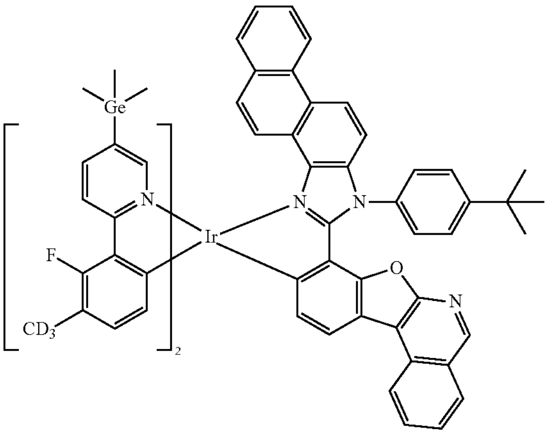
-continued
3609
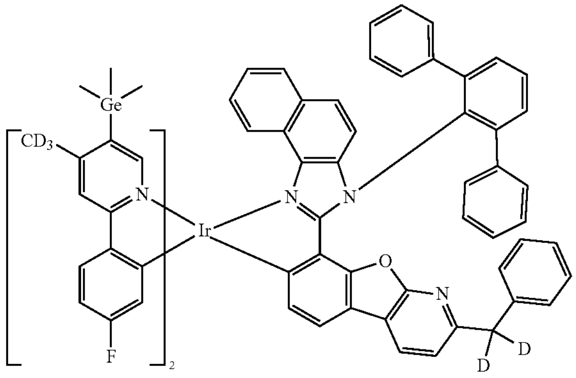
3610
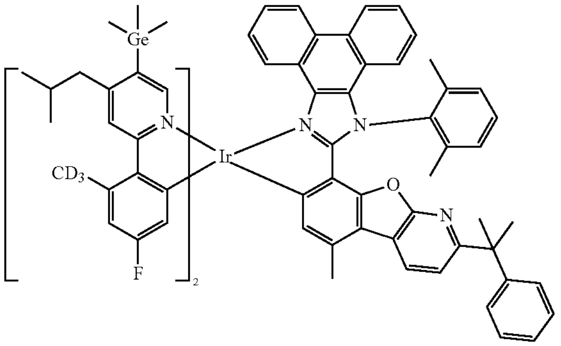
3611
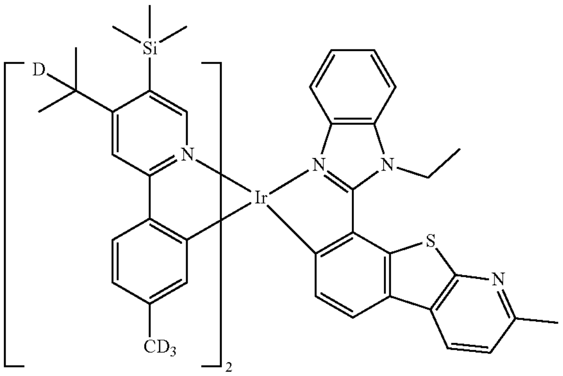
3612
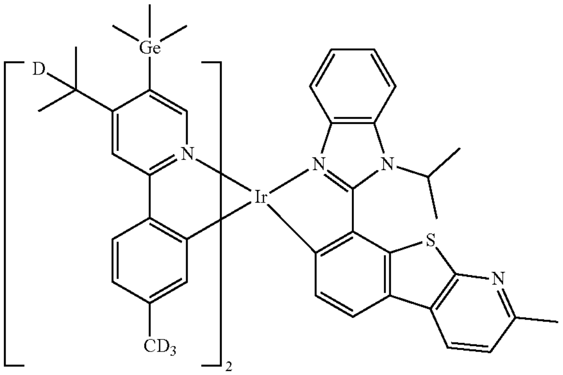

-continued
3613
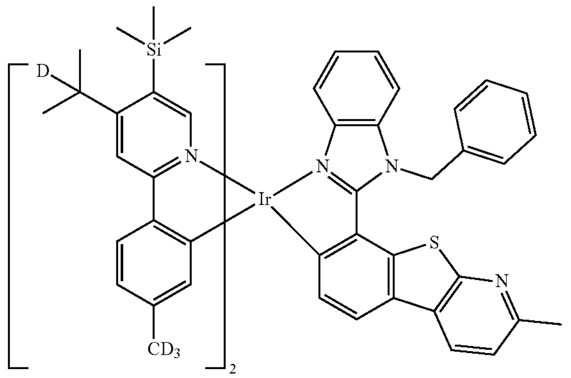
3614
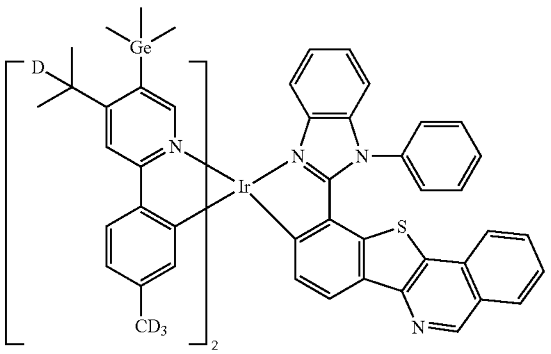
3615
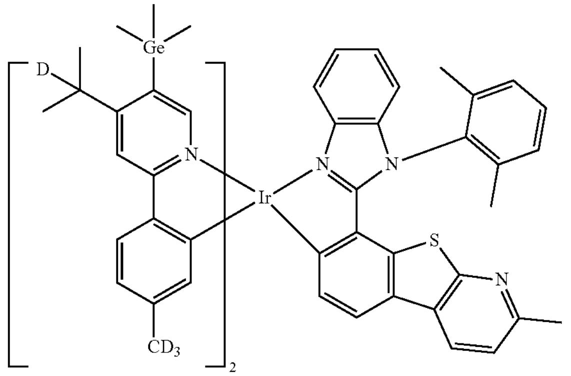
3616
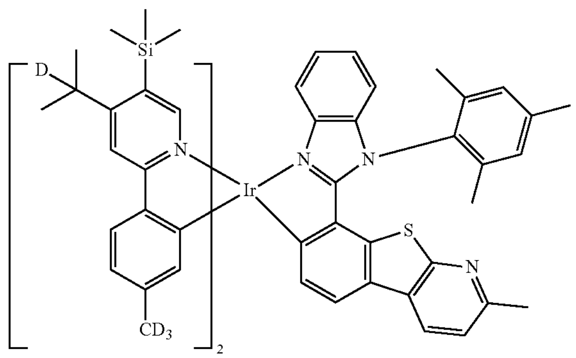
-continued
3617
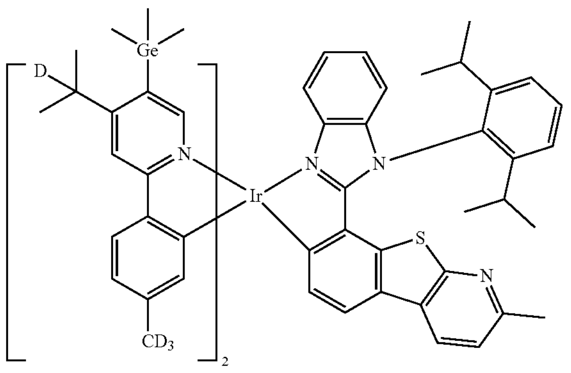
3618
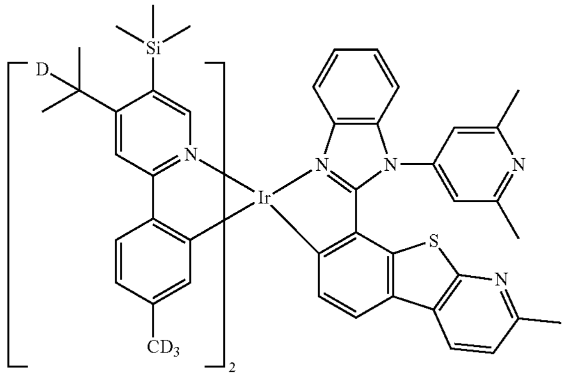
3619
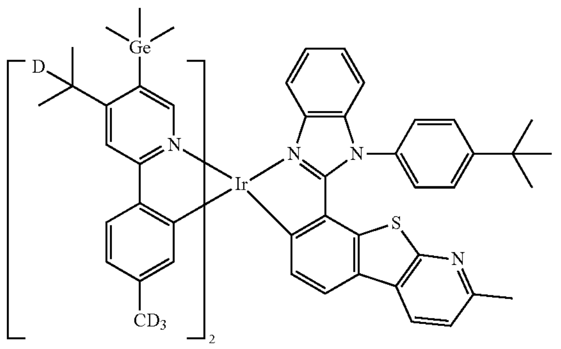
3620
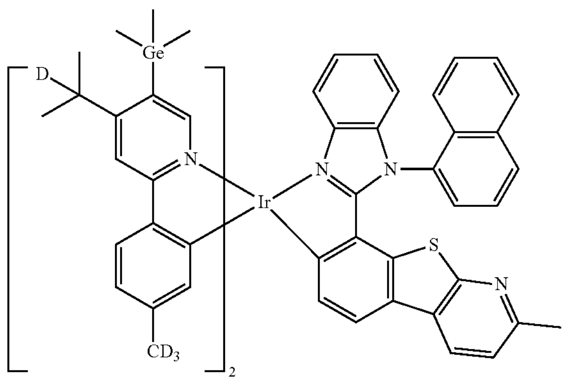

-continued
3621
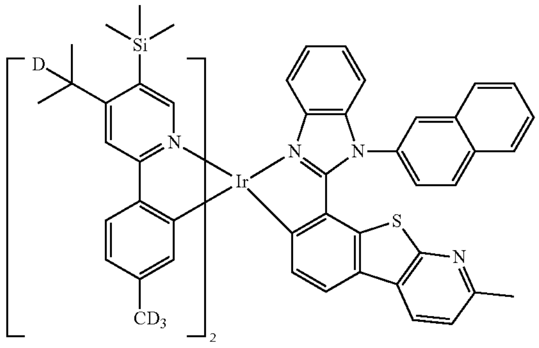
3622
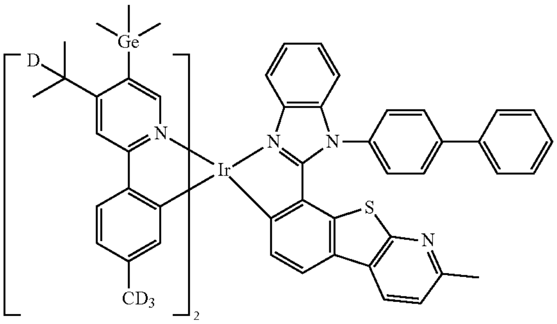
3623
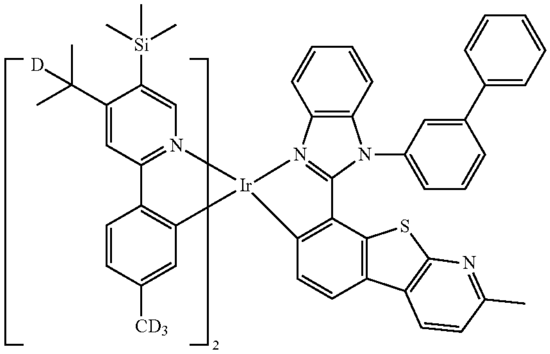
3624
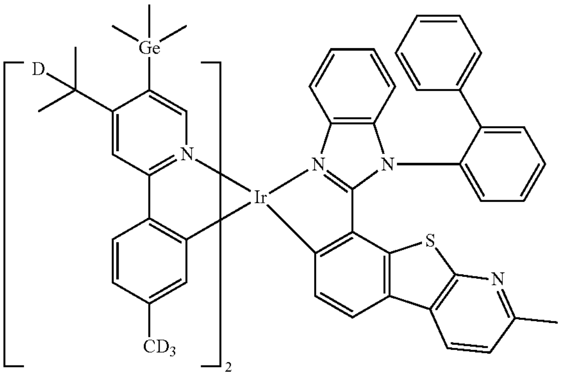
-continued
3625
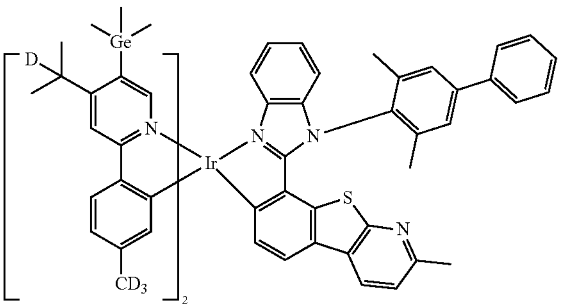
3626
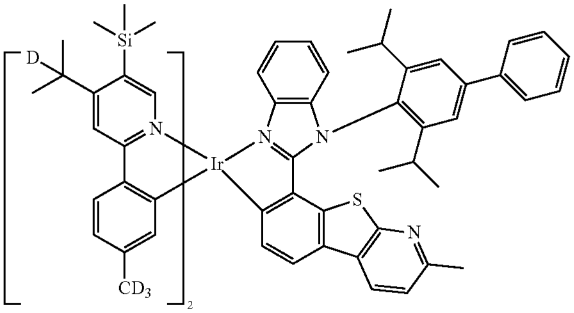
3627
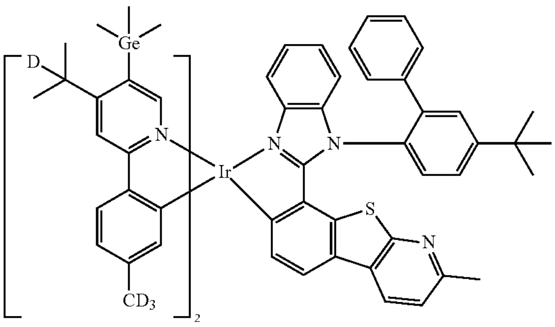
3628
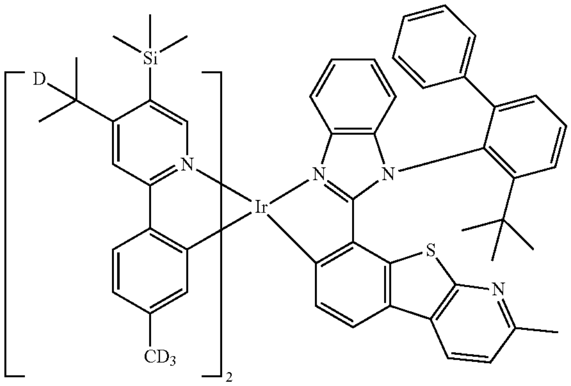

-continued
3629
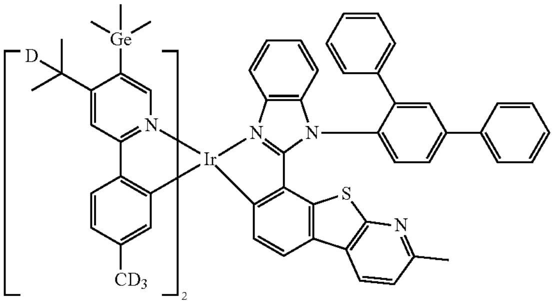
3630
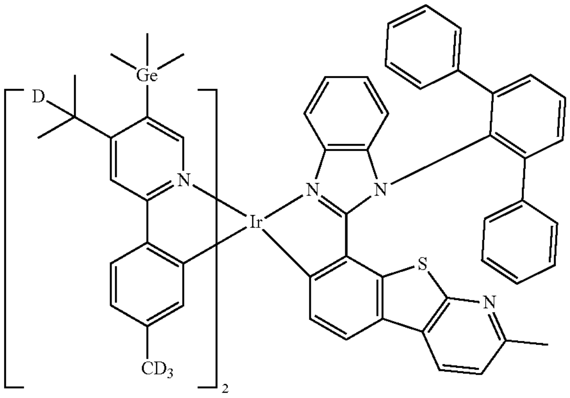
3631
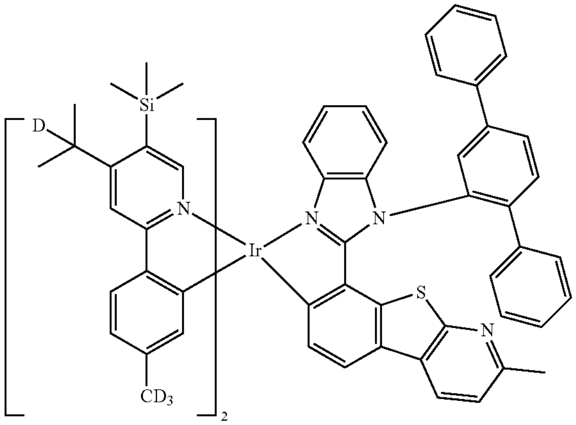
3632
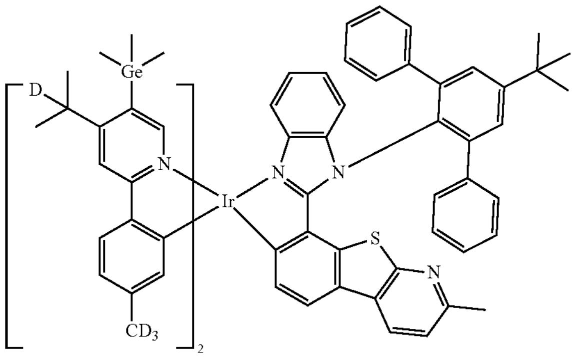
-continued
3633
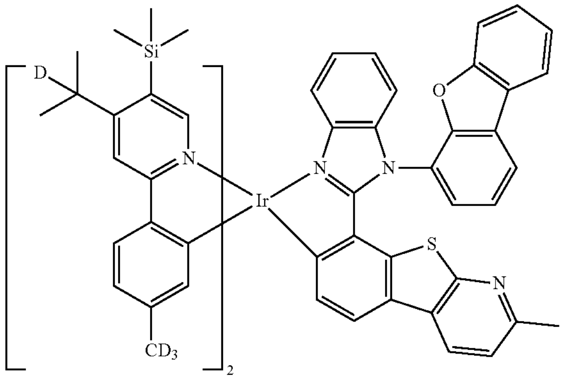
3634
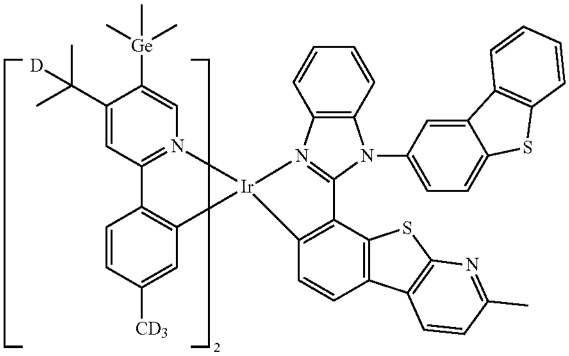
3635
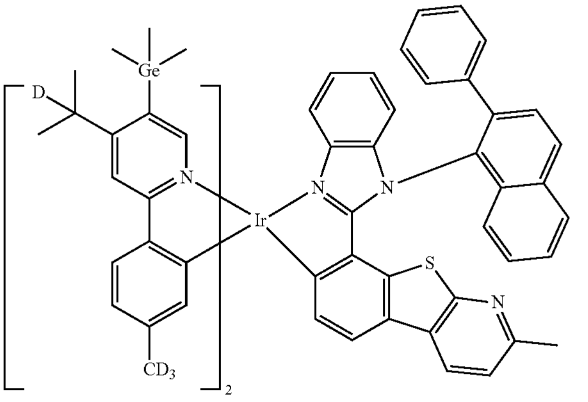
3636
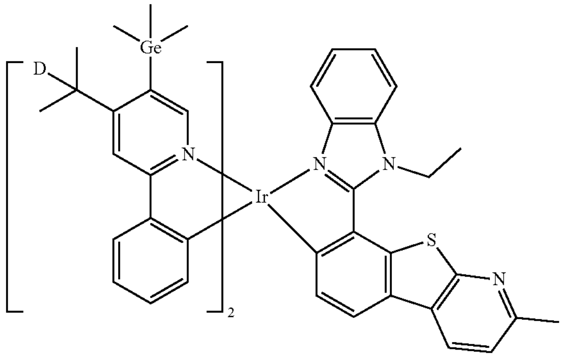

-continued
3637
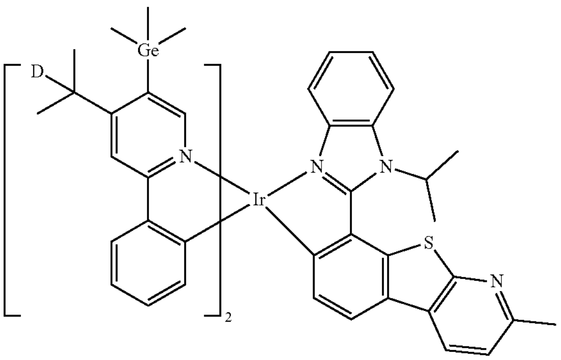
3638
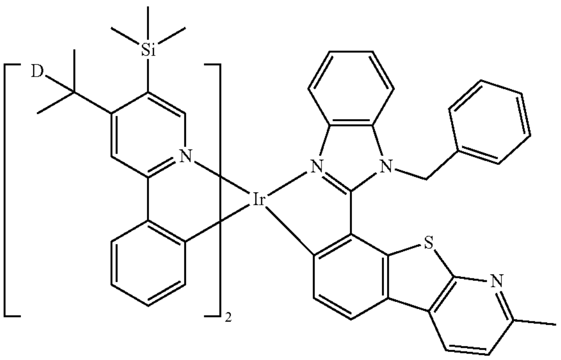
3639
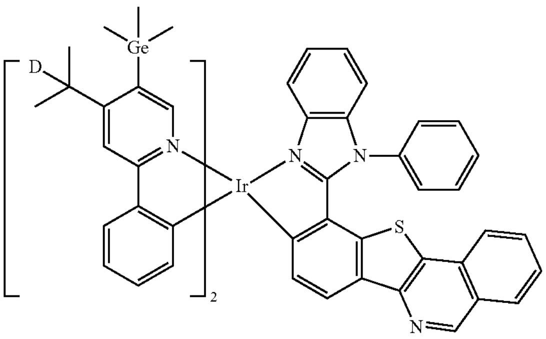
3640
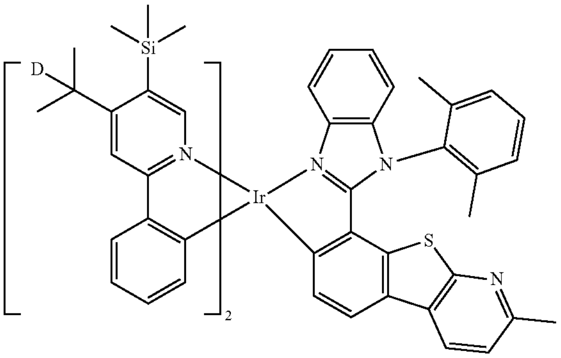
-continued
3641
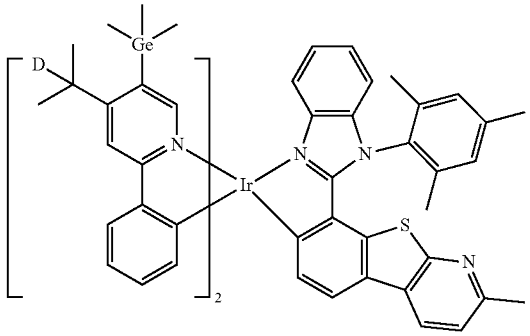
3642
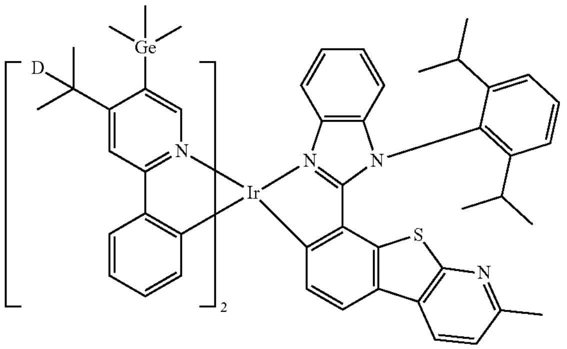
3643
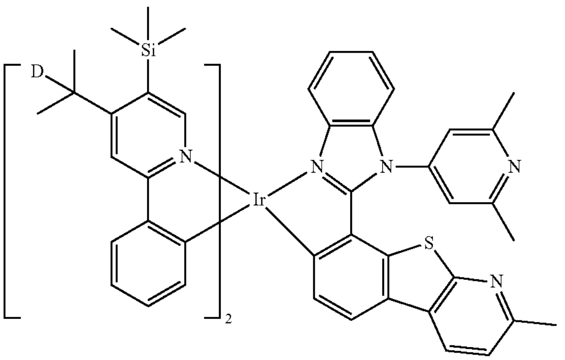
3644
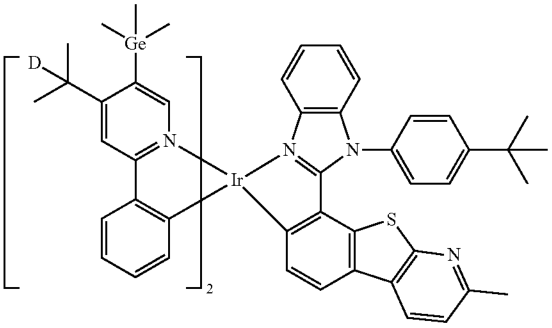

-continued
3645
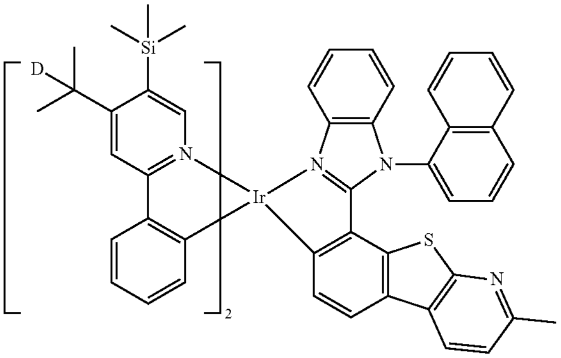
3646
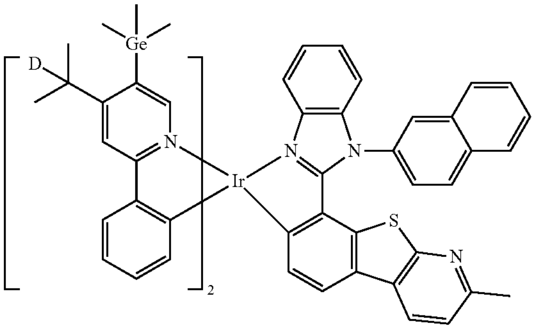
3647
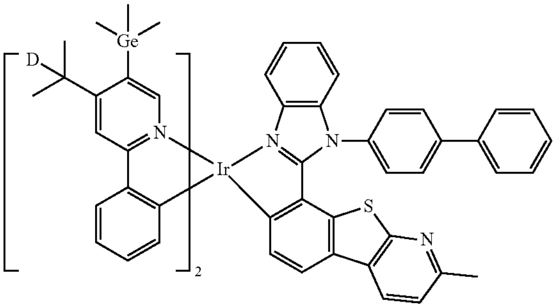
3648
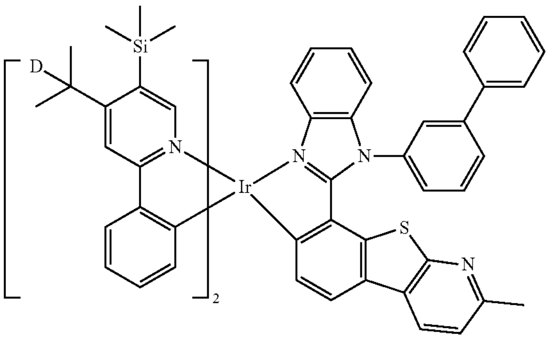
-continued
3649
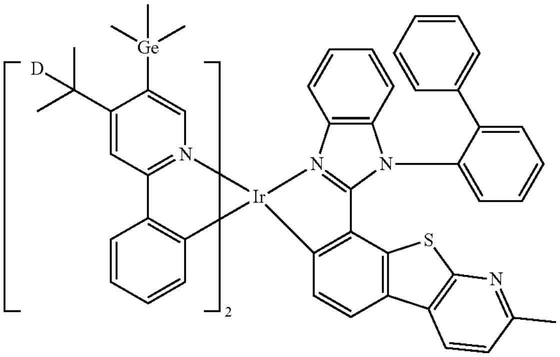
3650
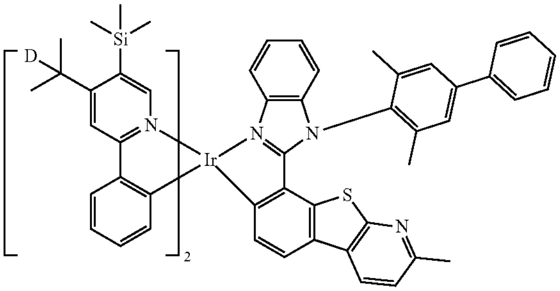
3651
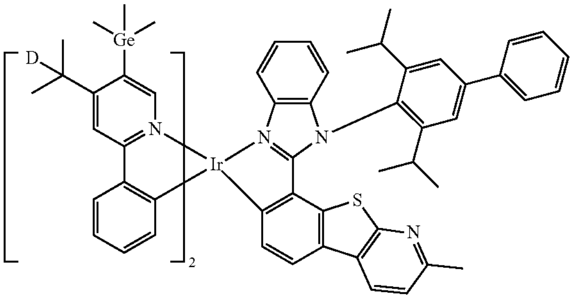
3652
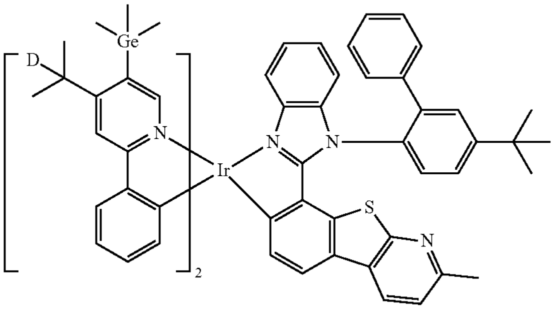

-continued
3653
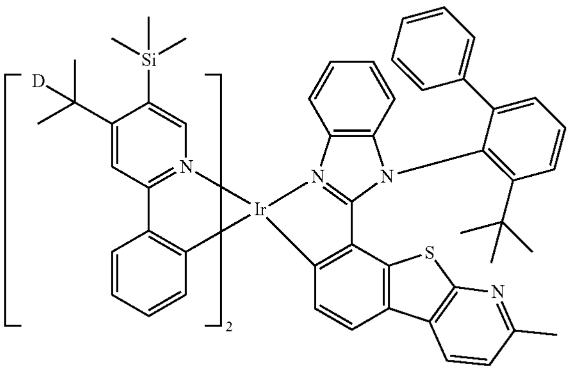
3654
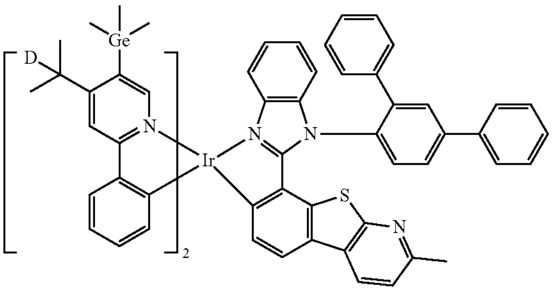
3655
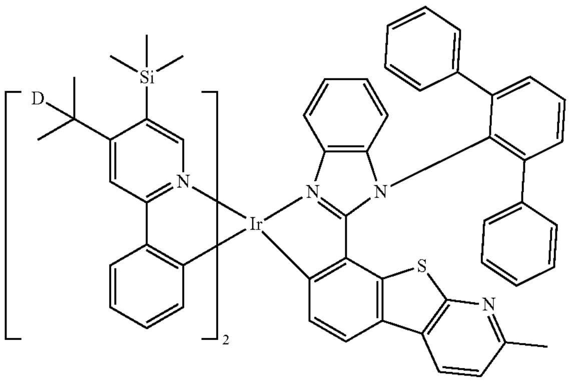
3656
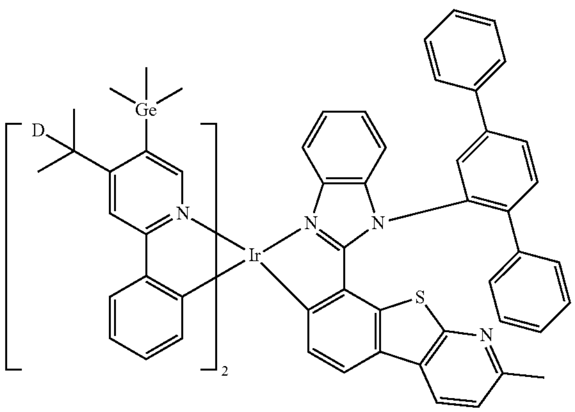
-continued
3657
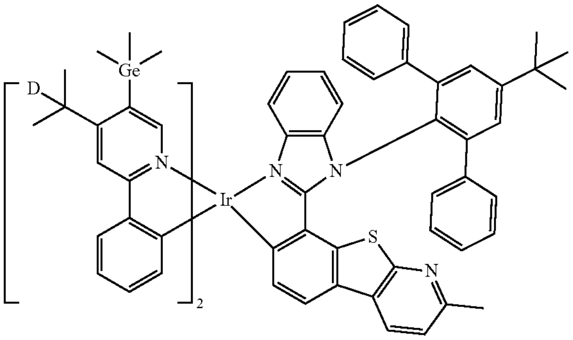
3658
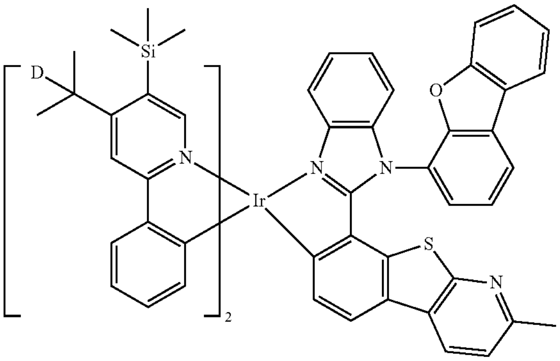
3659
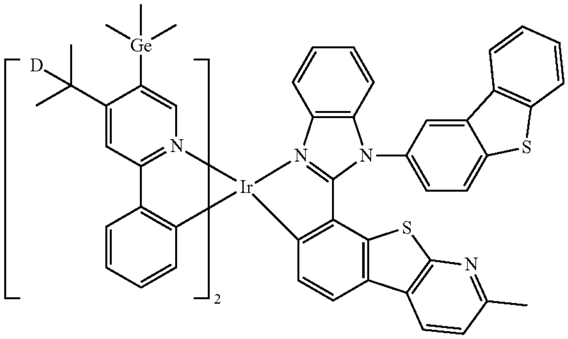
3660
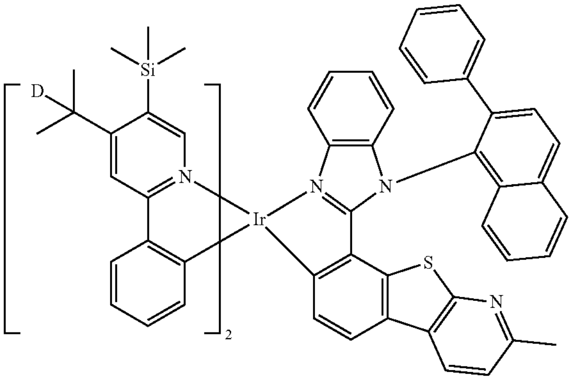

-continued
3661
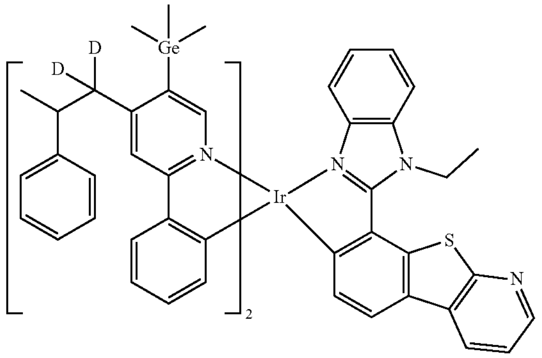
3662
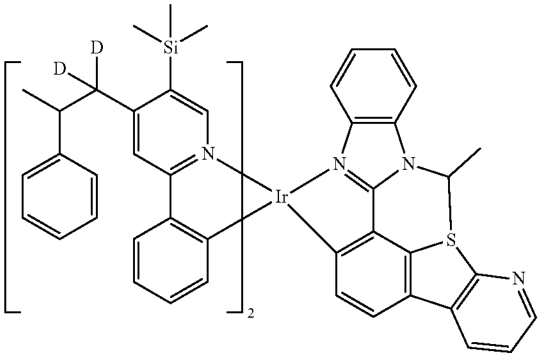
3663
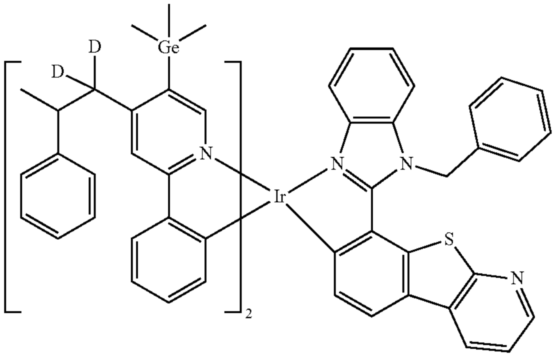
3664
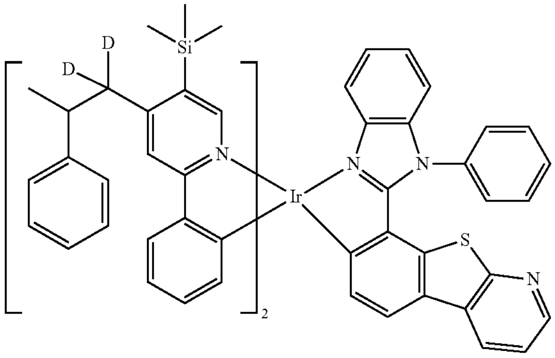
-continued
3665
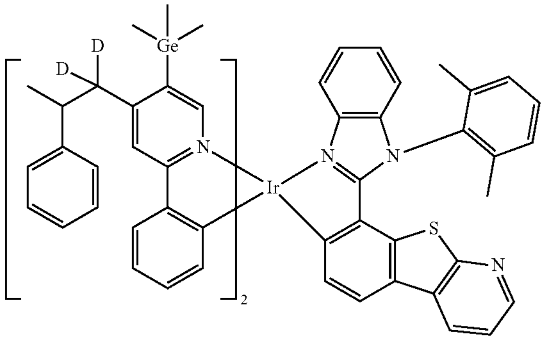
3666
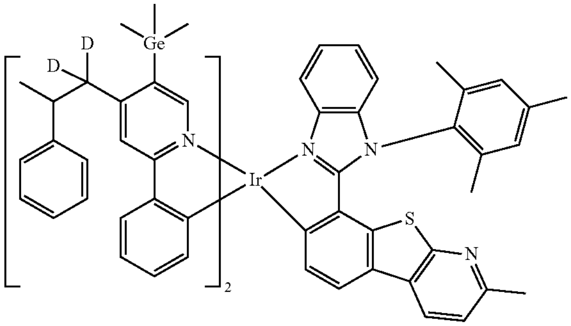
3667
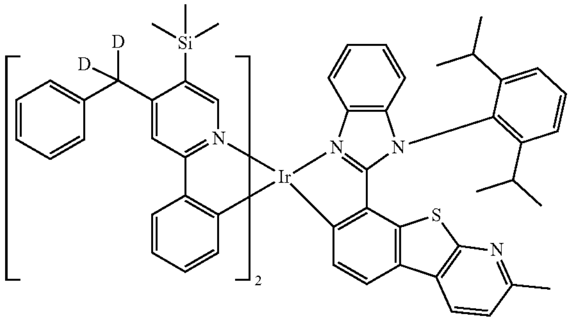
3668
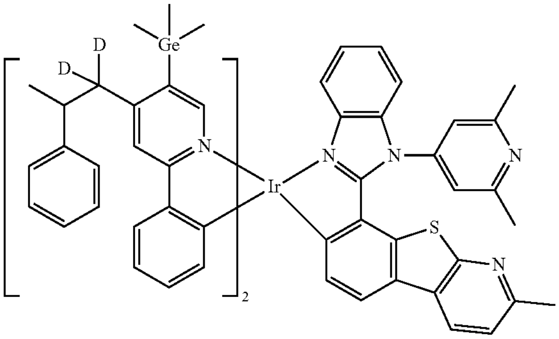

-continued
3669
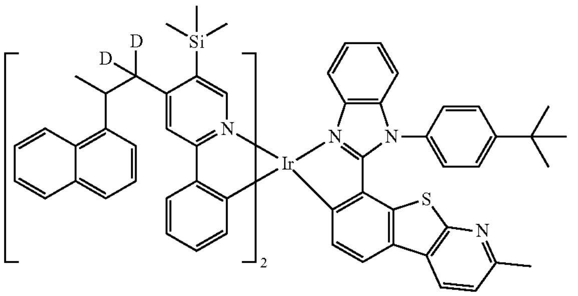
3670
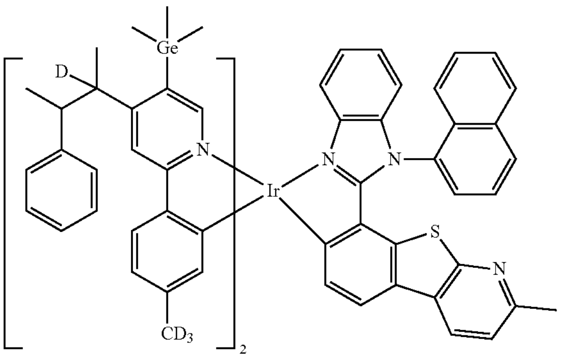
3671
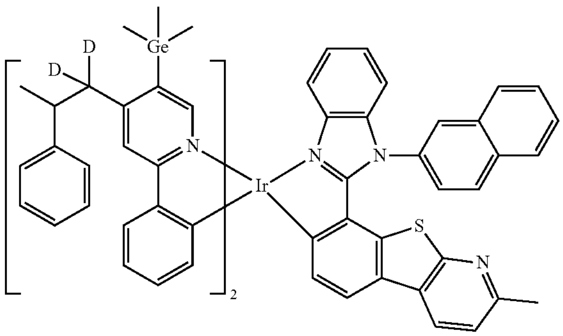
3672
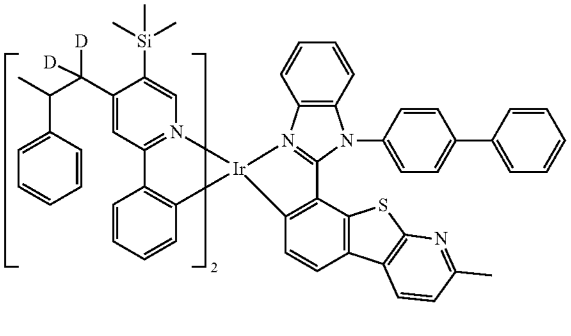
-continued
3673
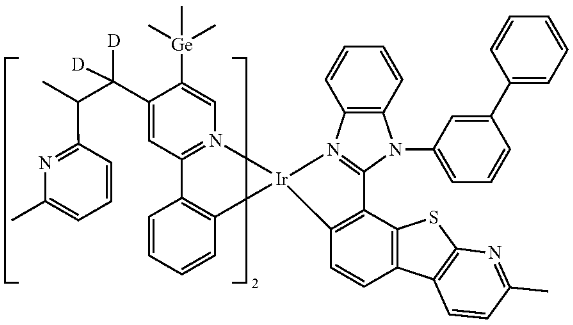
3674
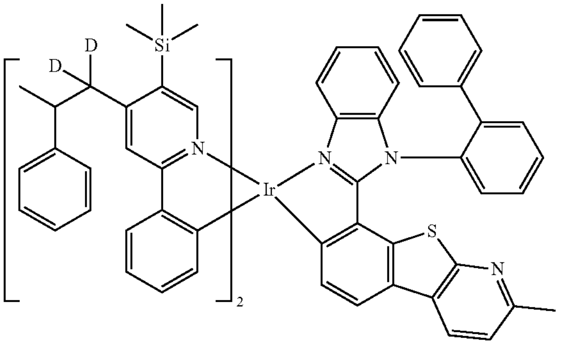
3675
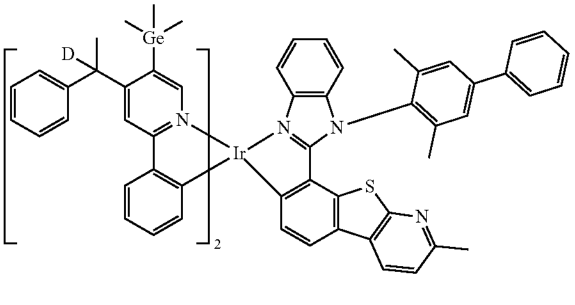
3676
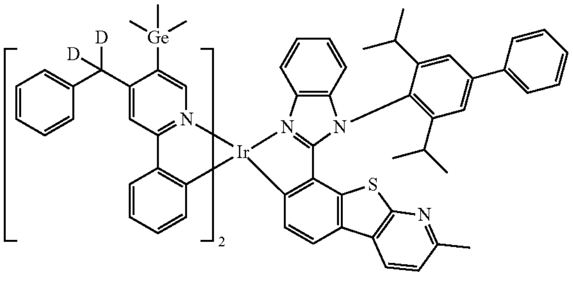

-continued
3677
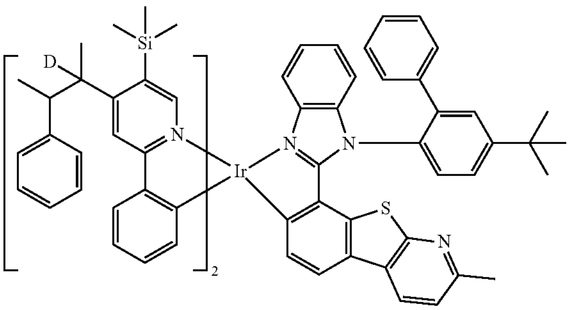
3678
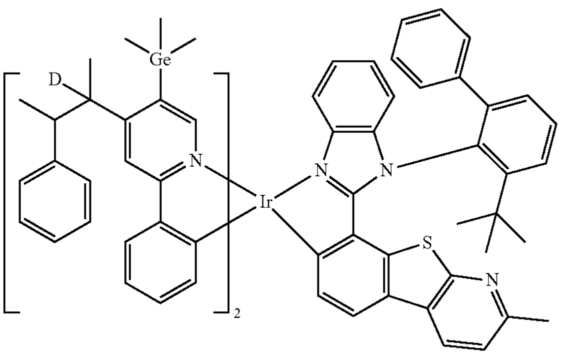
3679
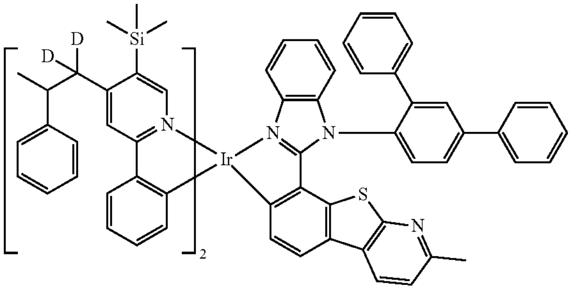
3680
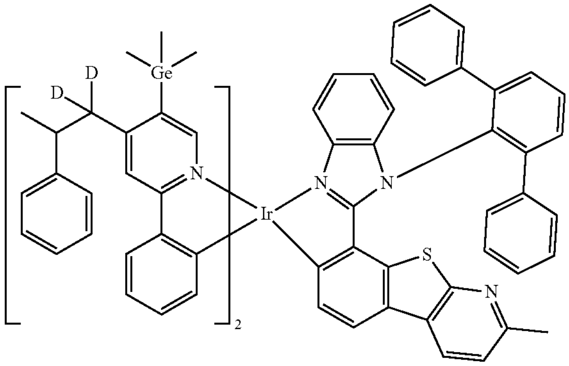
-continued
3681
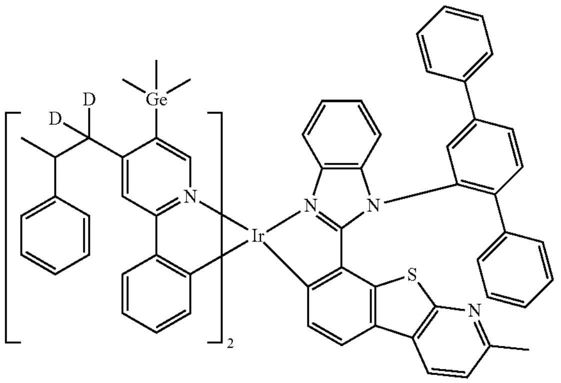
3682
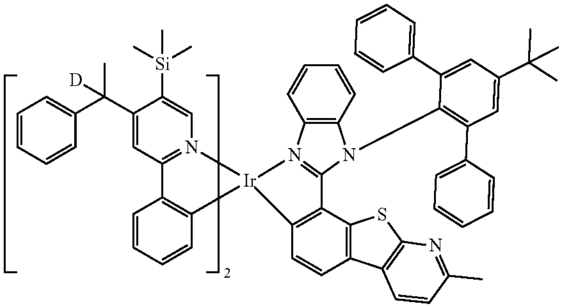
3683
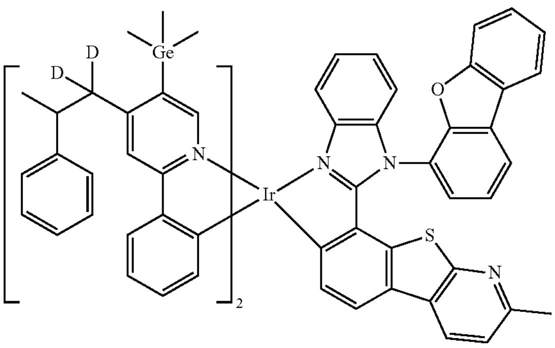
3684
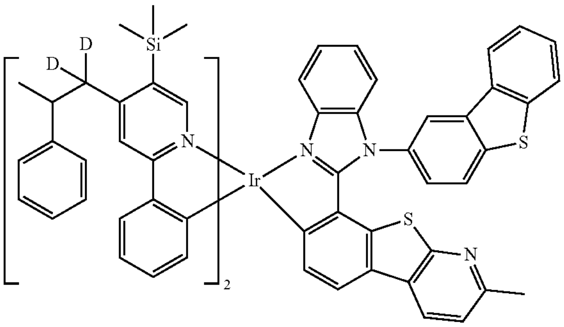

-continued
3685
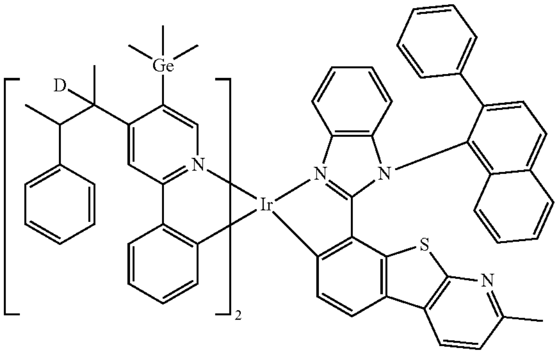
3686
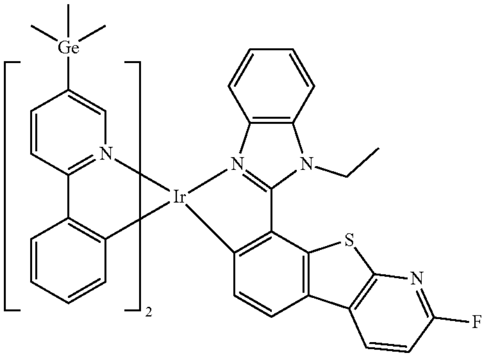
3687
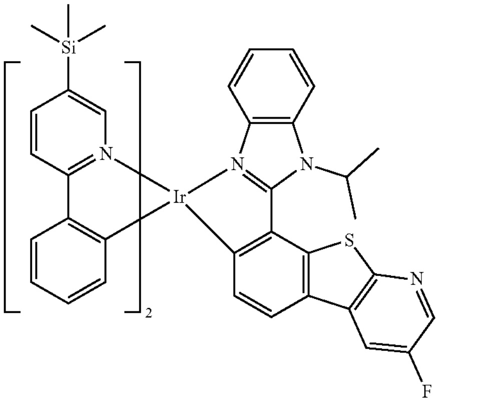
3688
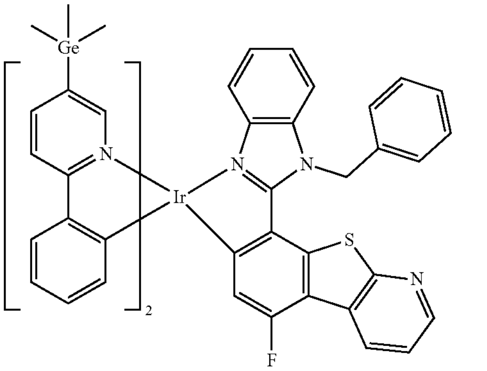
-continued
3689
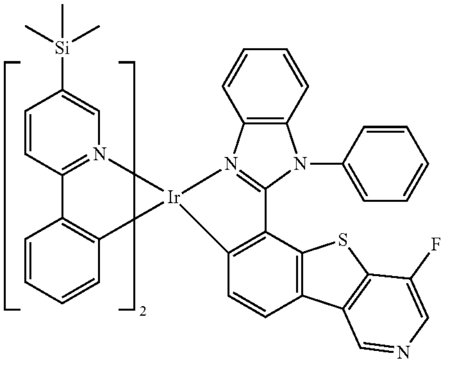
3690
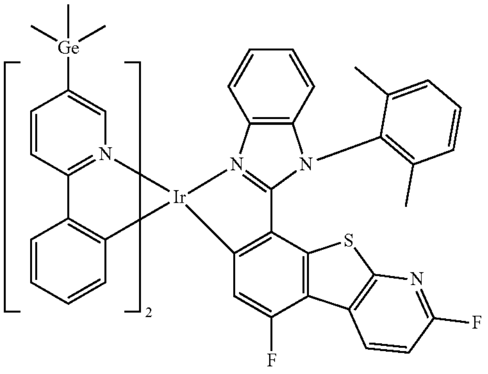
3697
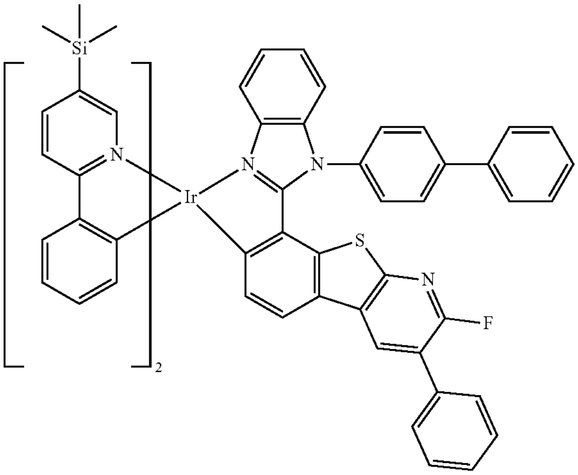

-continued
3691
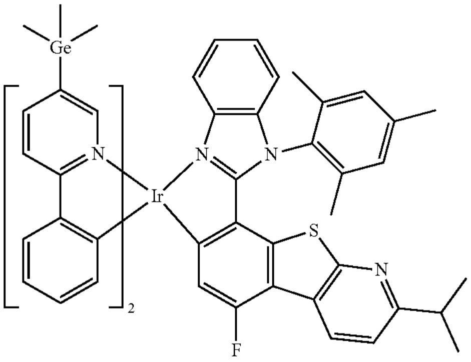
3692
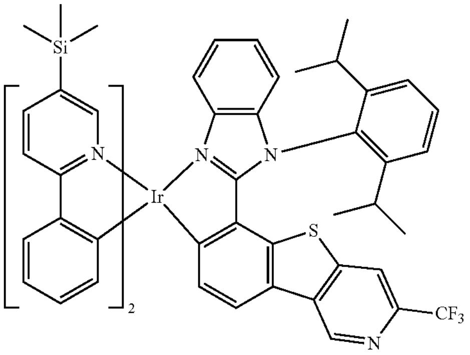
3693
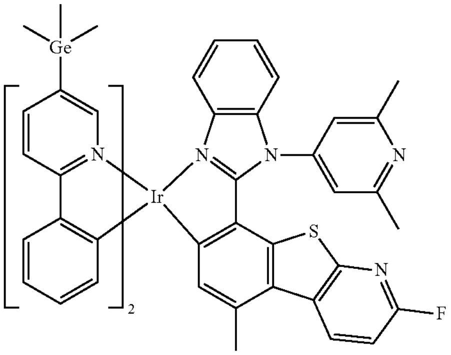
3694
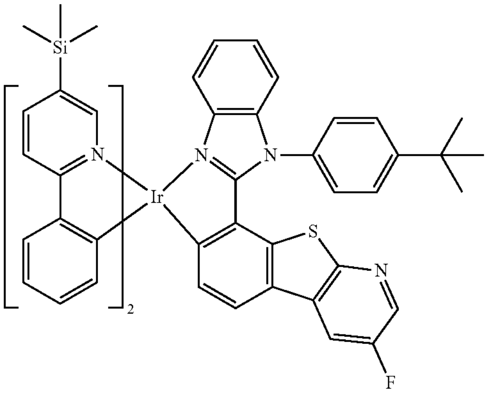
3695
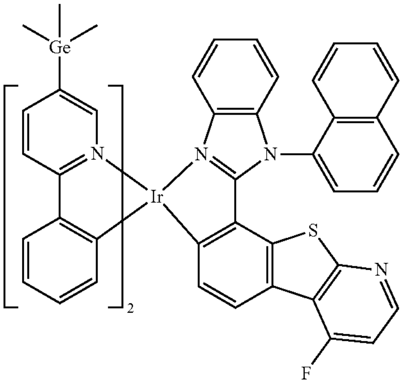
3696
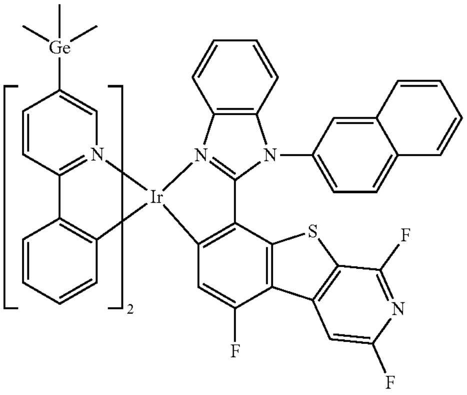
3697
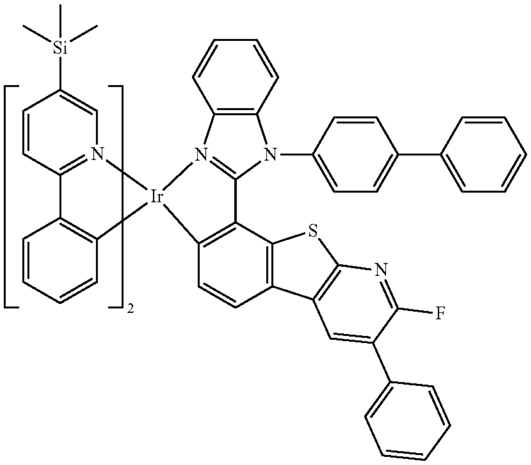

-continued
3698
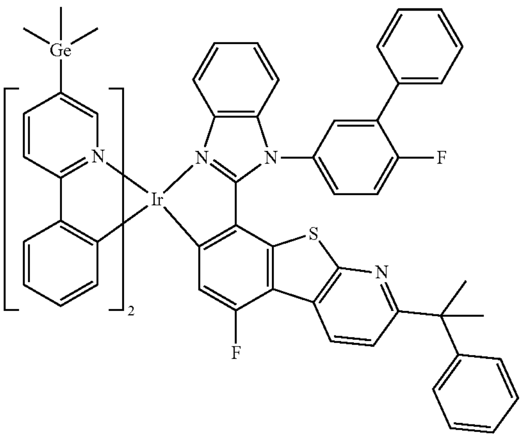
3699
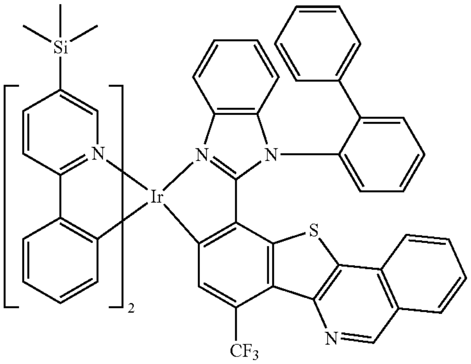
3700
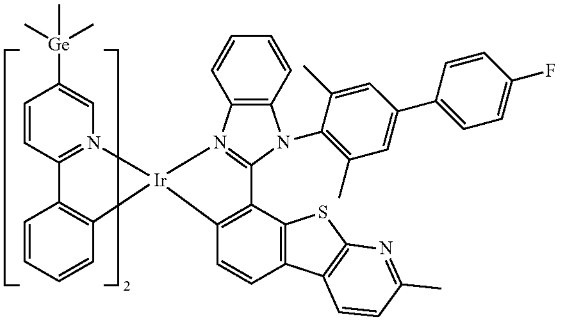
3701
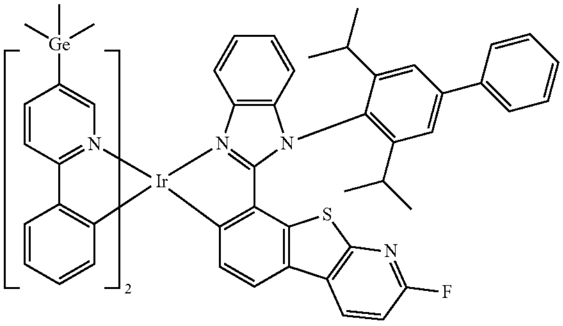
-continued
3702
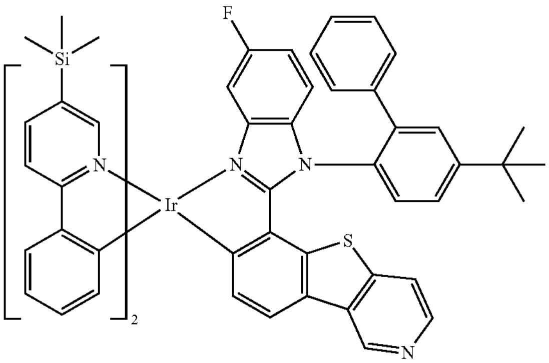
3703
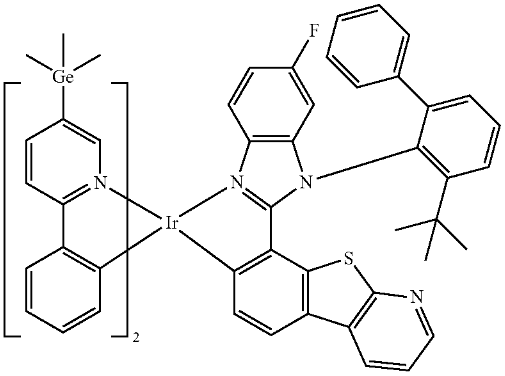
3704
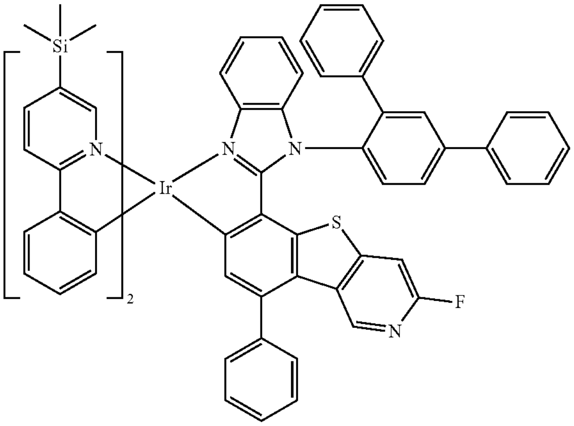
3705
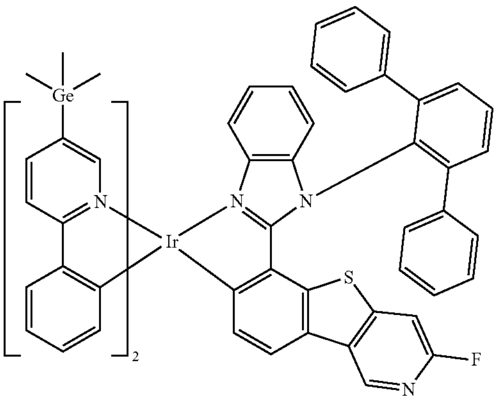

-continued
3706
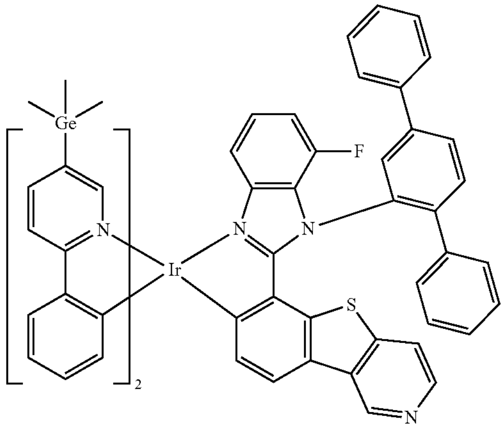
3707
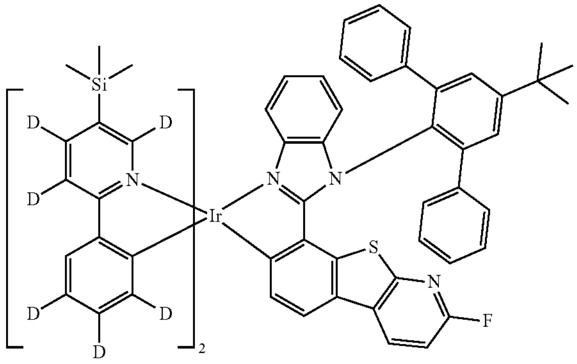
3708
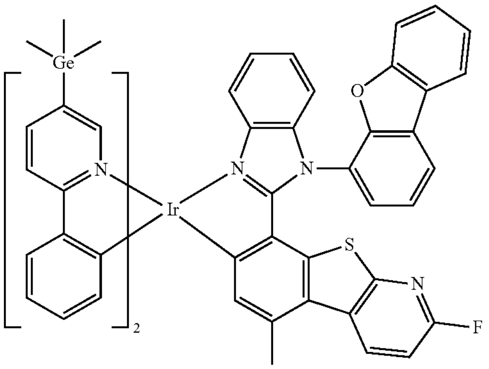
-continued
3709
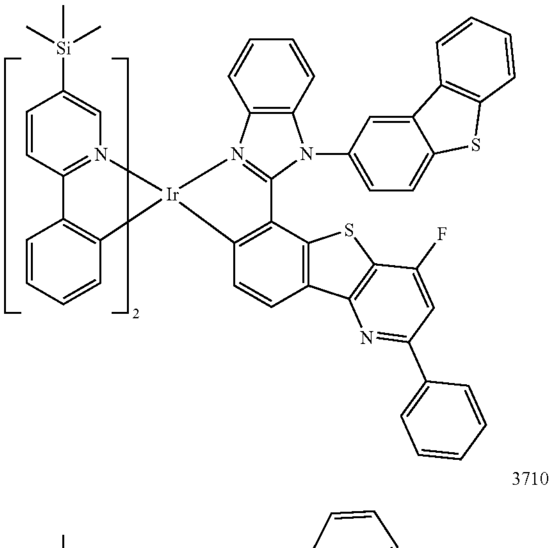
3710
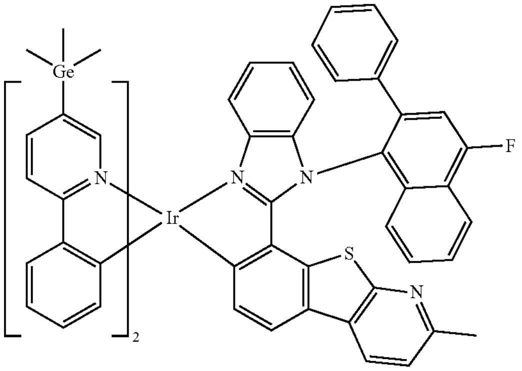
3711
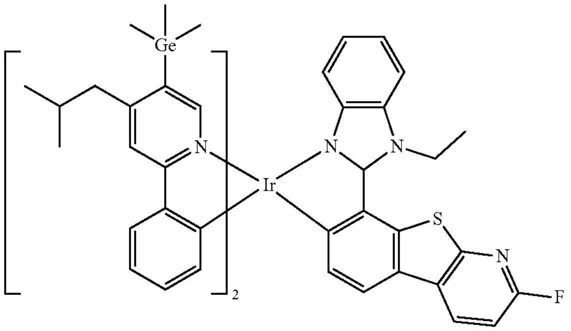
3712
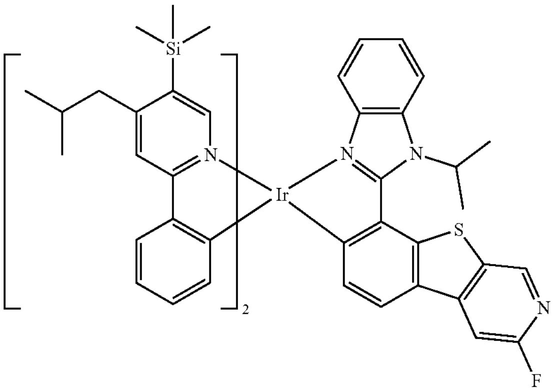

-continued
3713
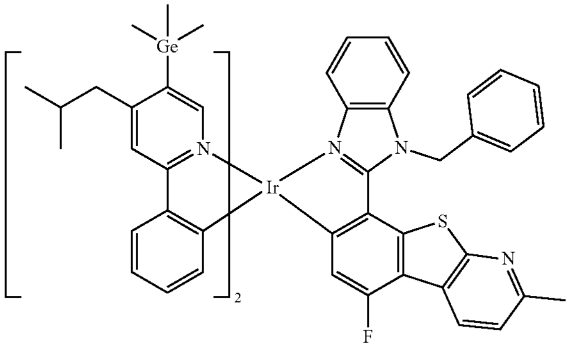
3714
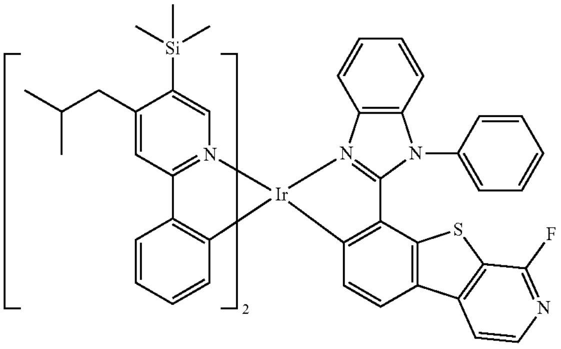
3715
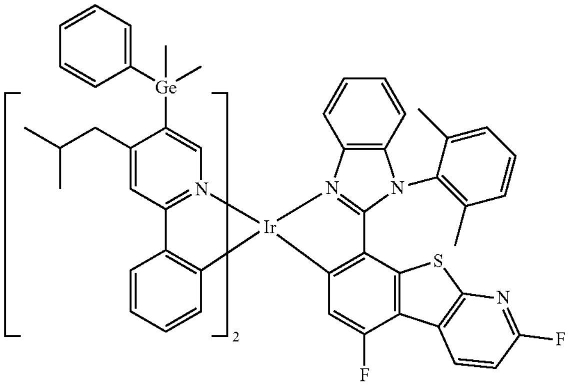
3716
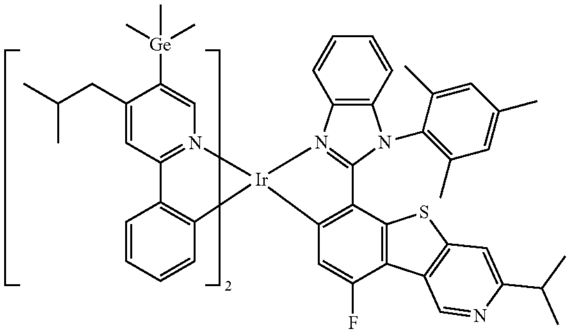
-continued
3717
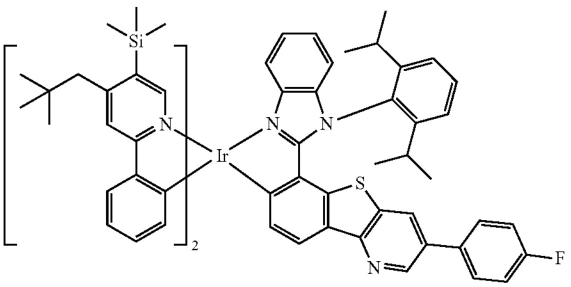
3718
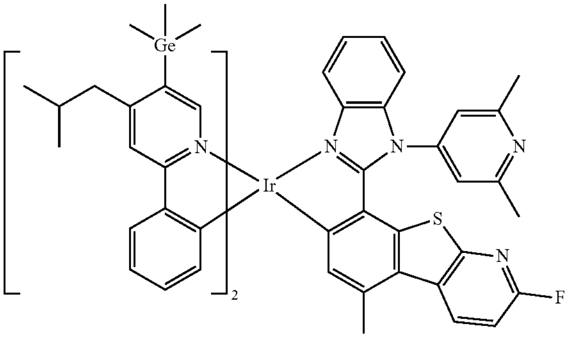
3719
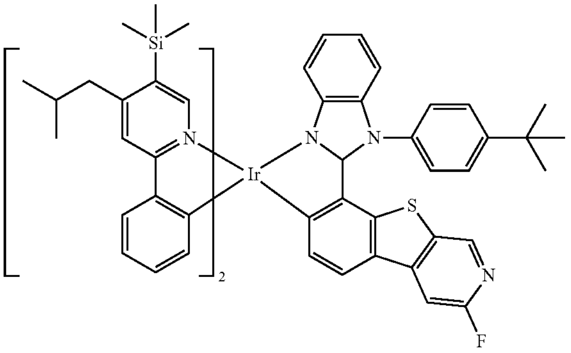
3720
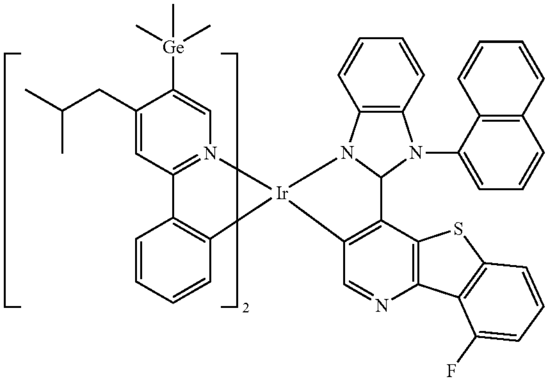

-continued
3721
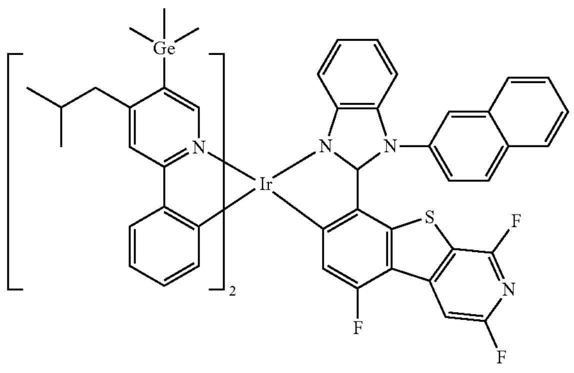
3722
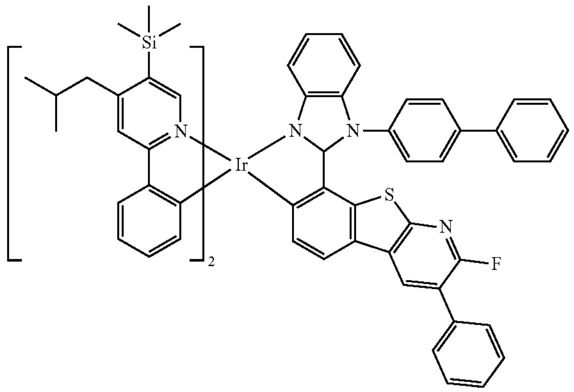
3723
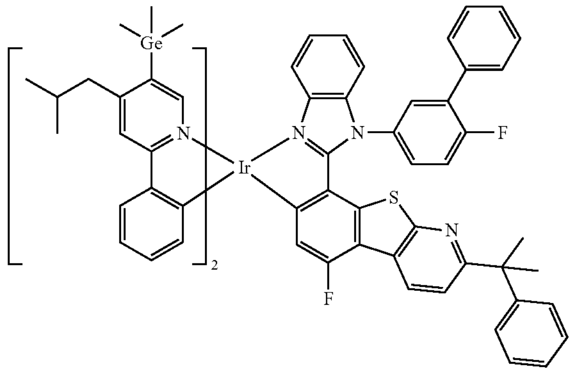
3724
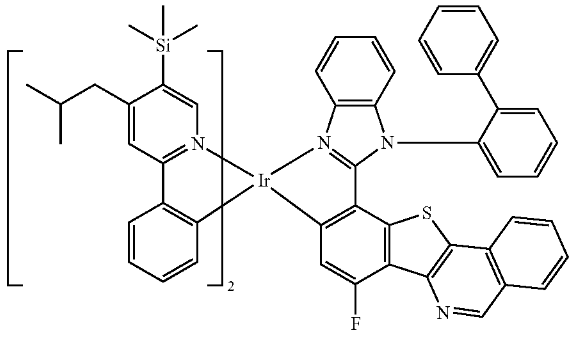
-continued
3725
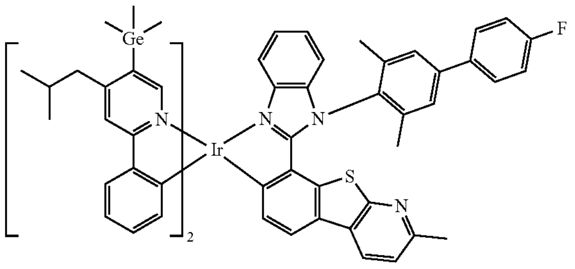
3726
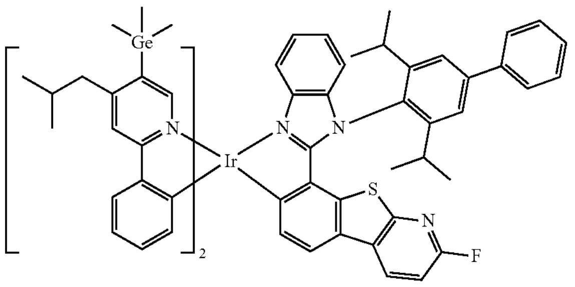
3727
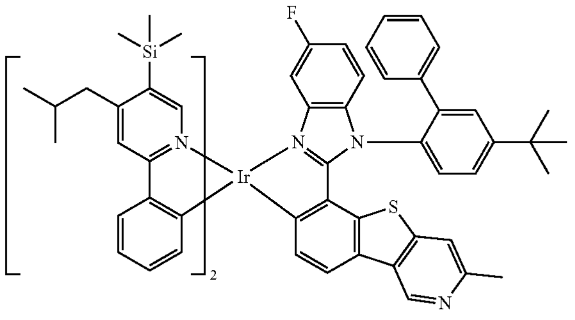
3728
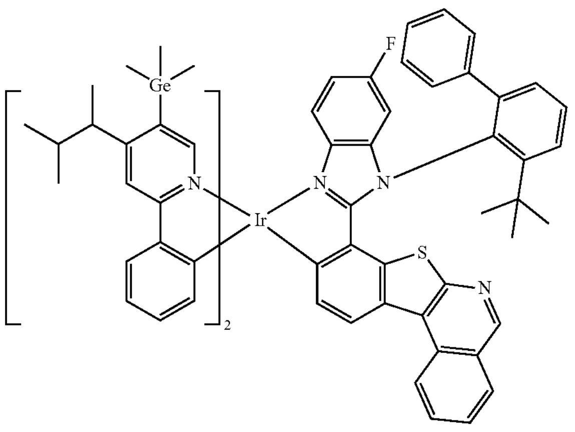

-continued
3729
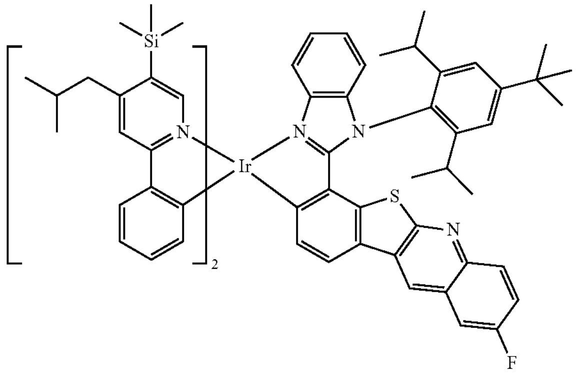
3730
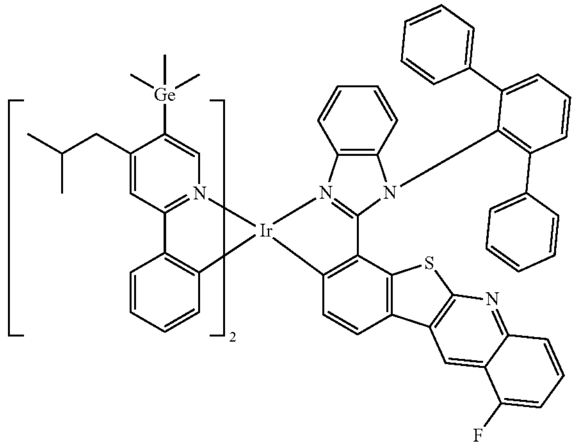
3731
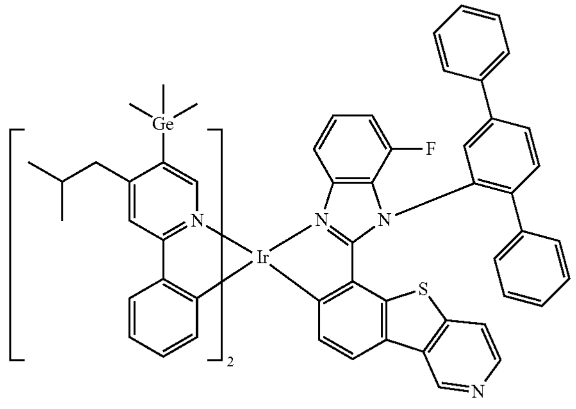
3732
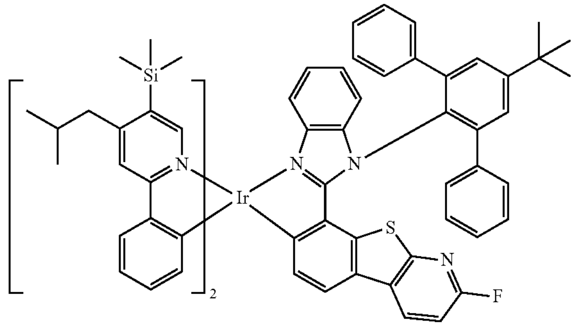
-continued
3733
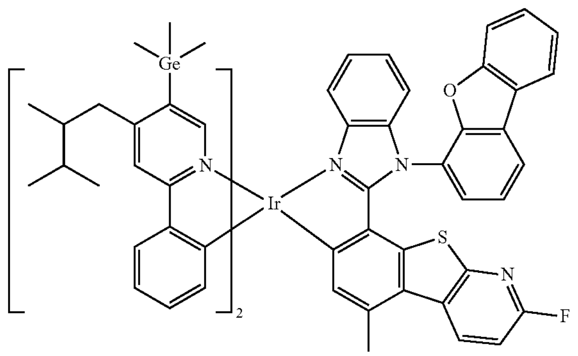
3734
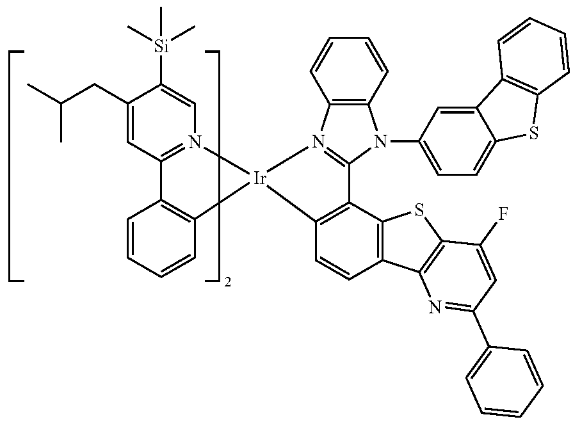
3735
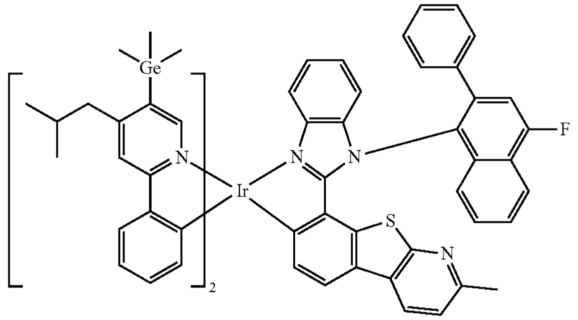

-continued
3736
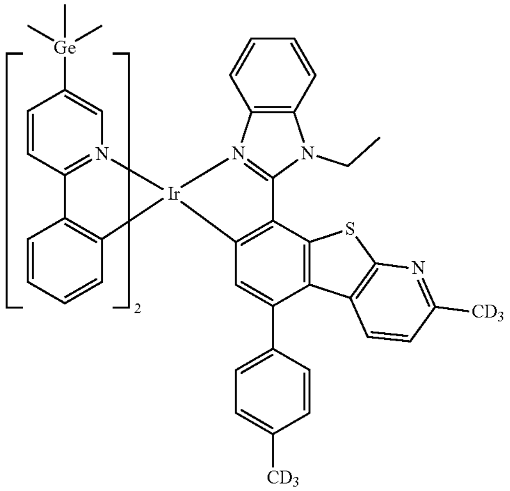
3737
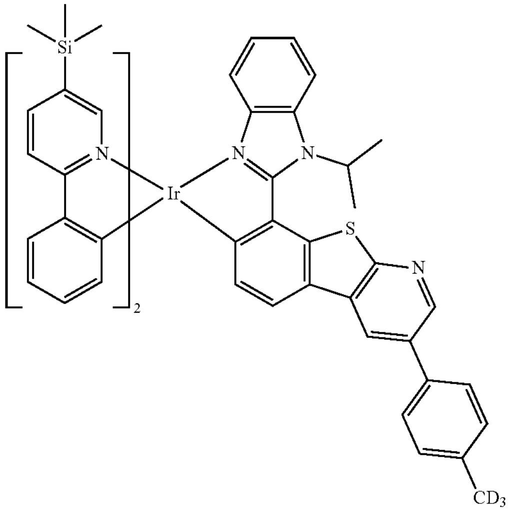
3738
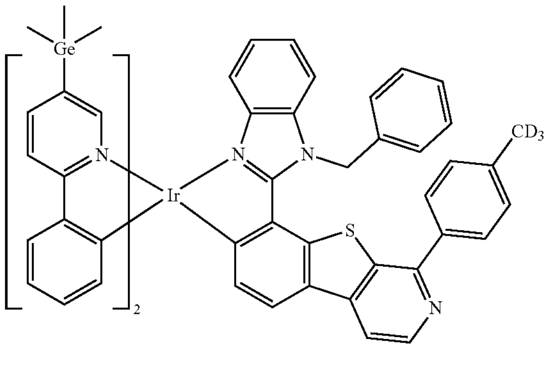
-continued
3739
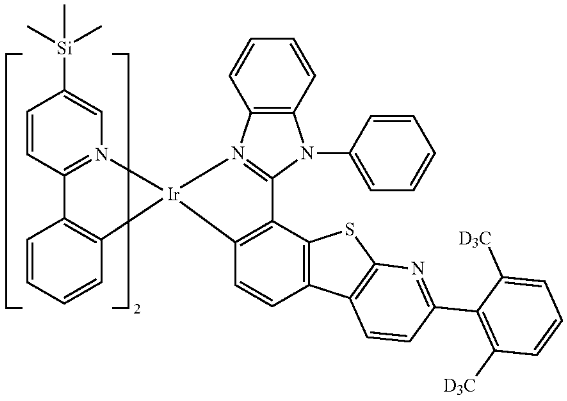
3740
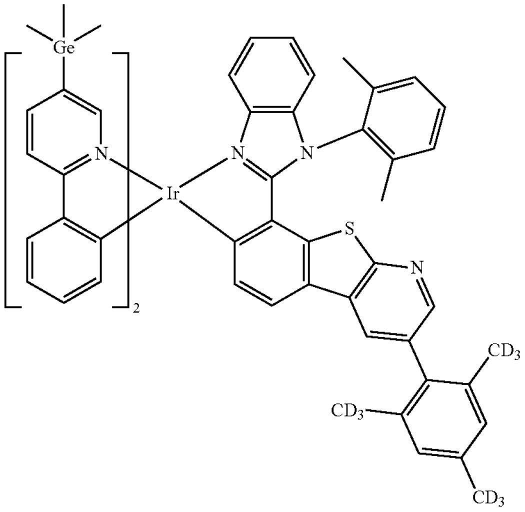
3741
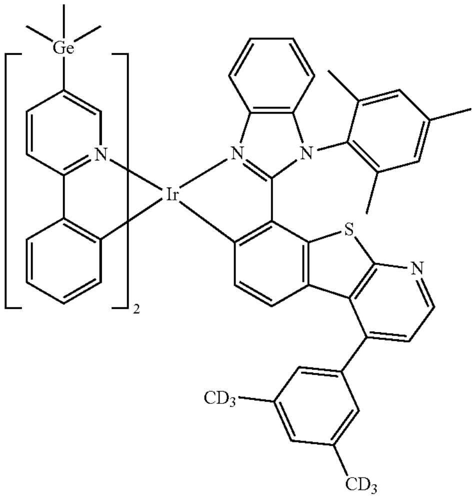

-continued
3742
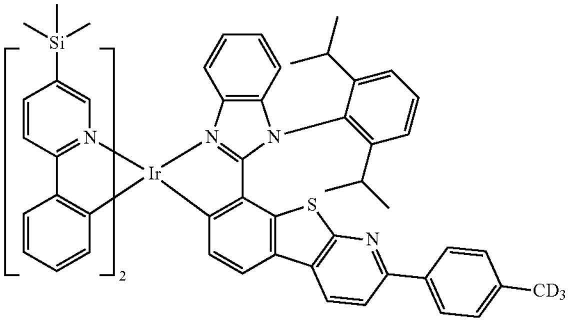
3743
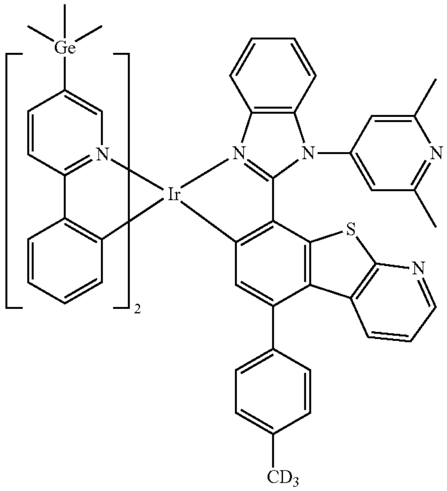
3744
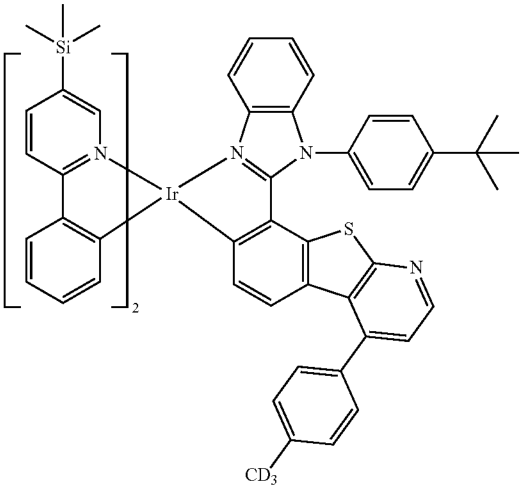
-continued
3745
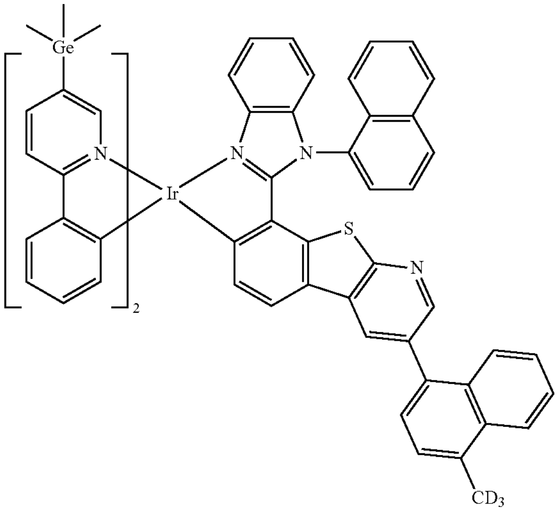
3746
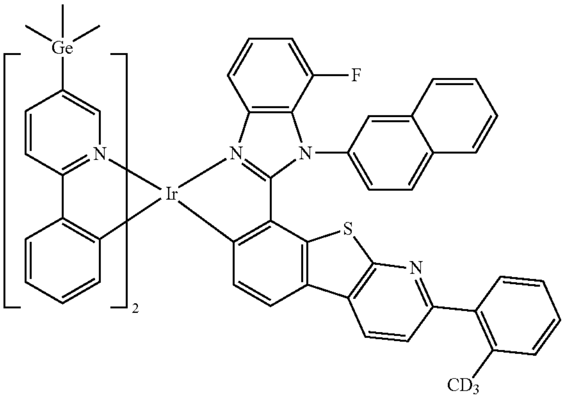
3747
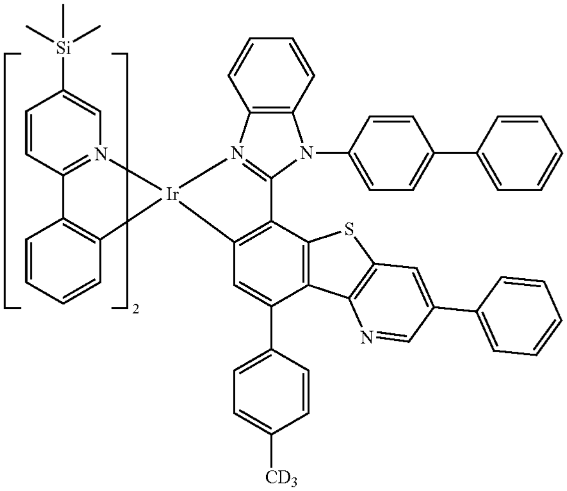

-continued
3748
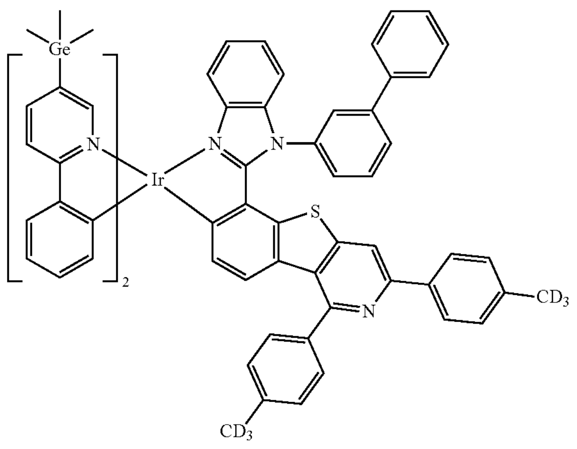
3749
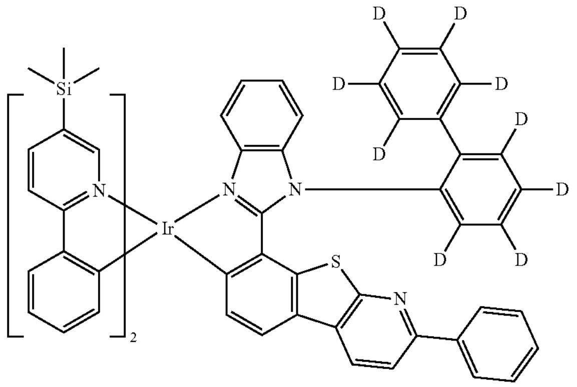
3750
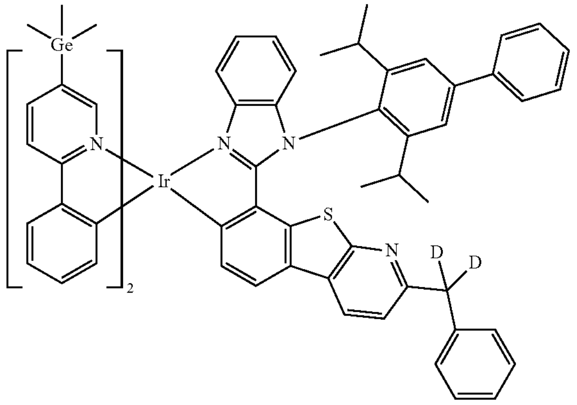
3751
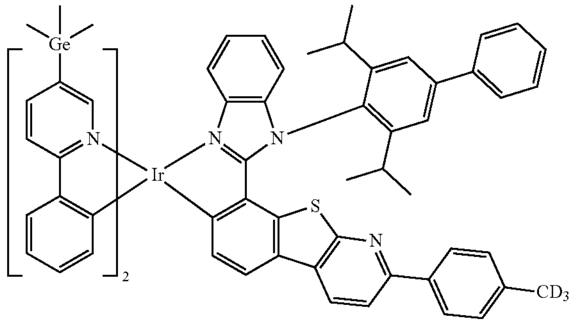
-continued
3752
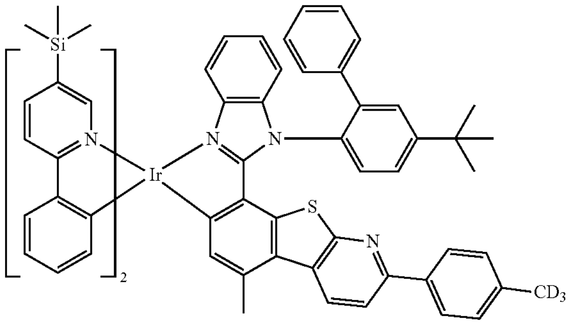
3753
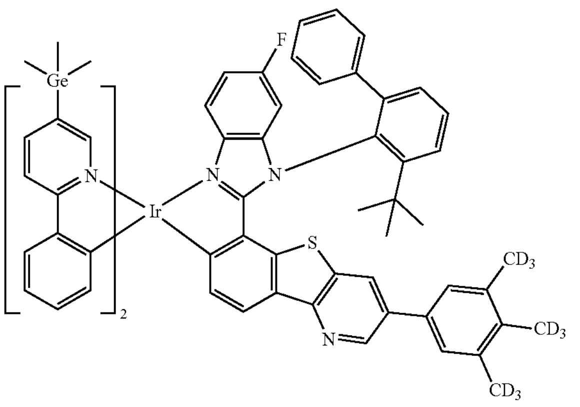
3754
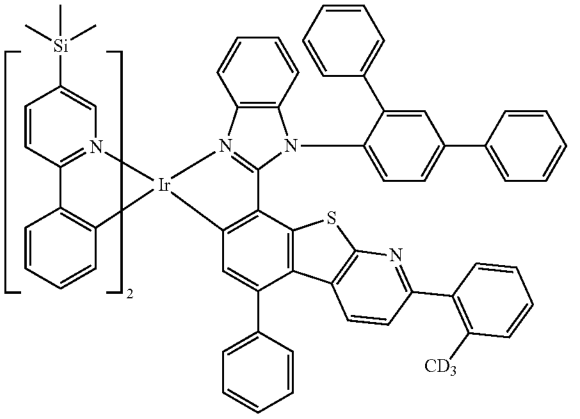
3755
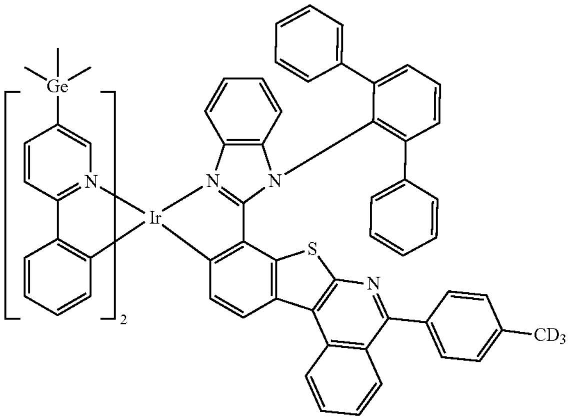

-continued
3756
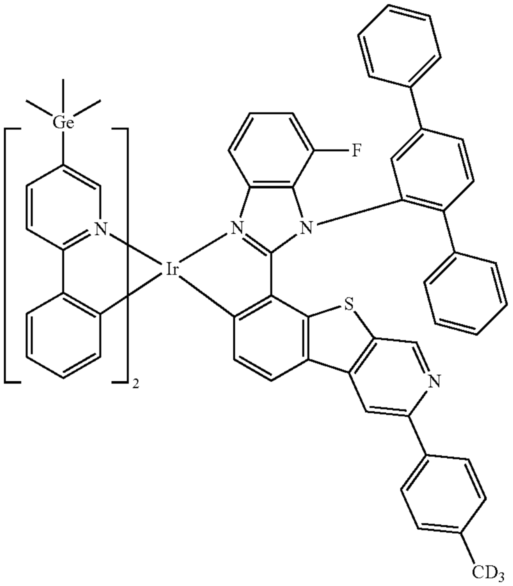
3757
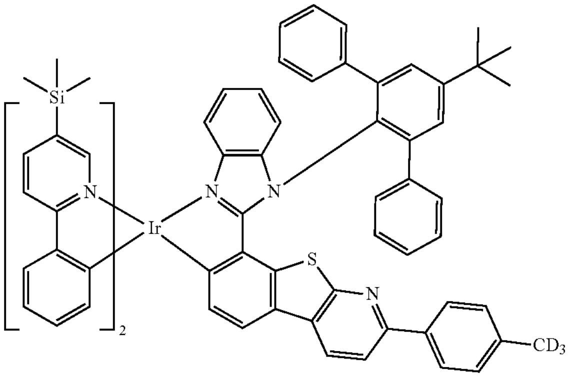
3758
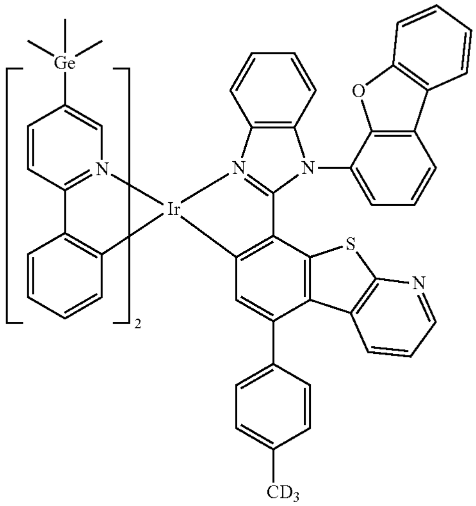
-continued
3759
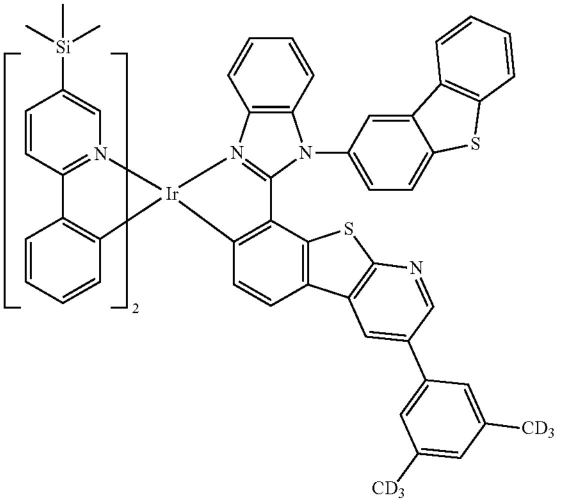
3760
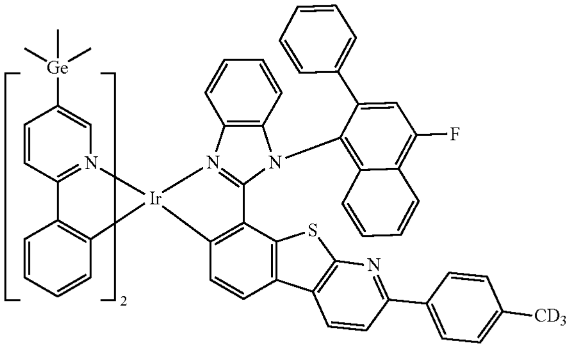
3761
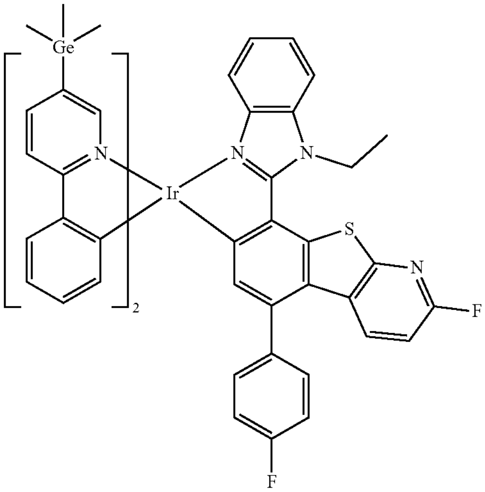

-continued
3762
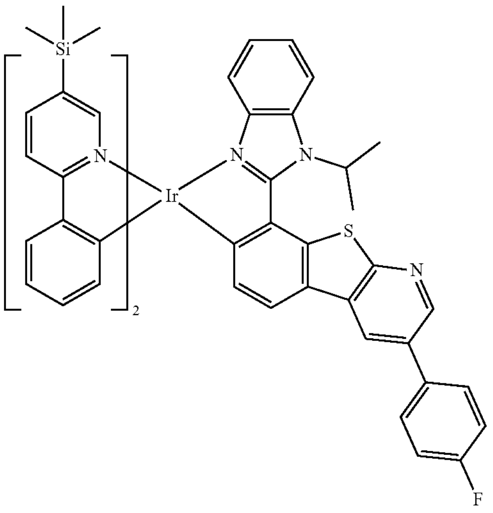
3763
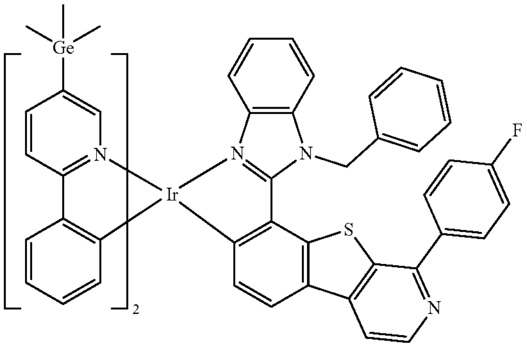
3764
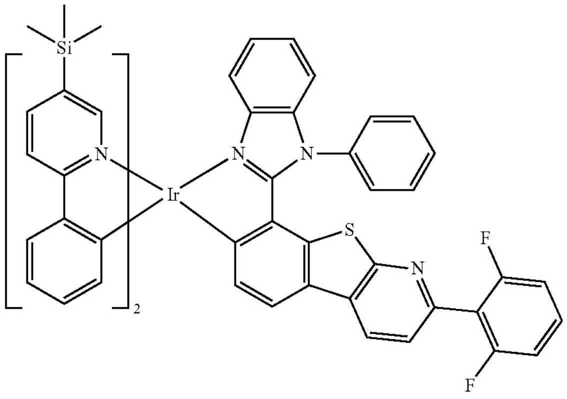
-continued
3765
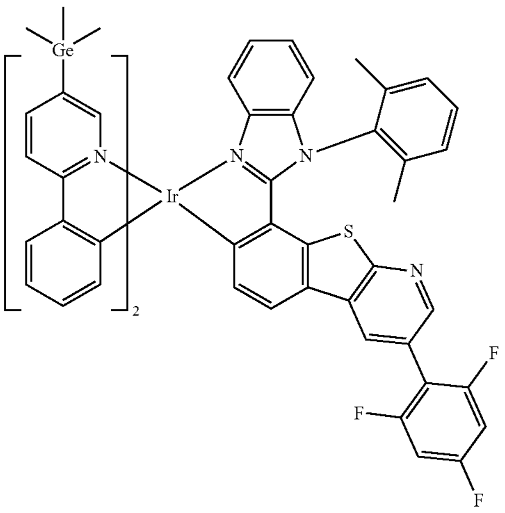
3766
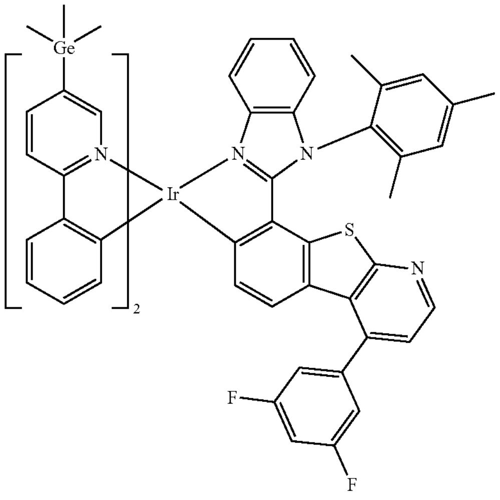
3767
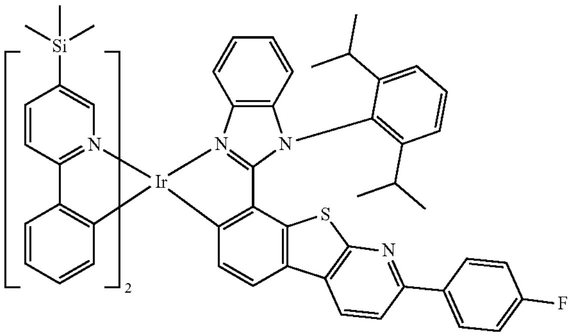

-continued
3768
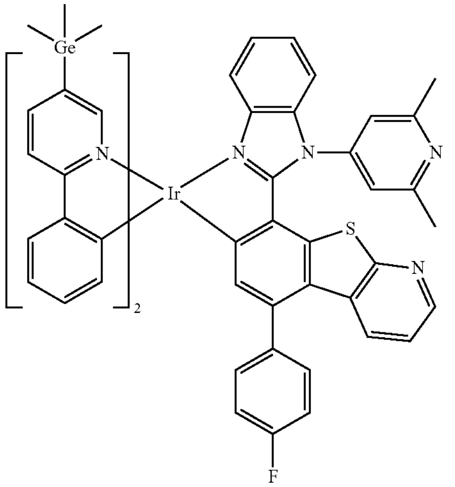
3769
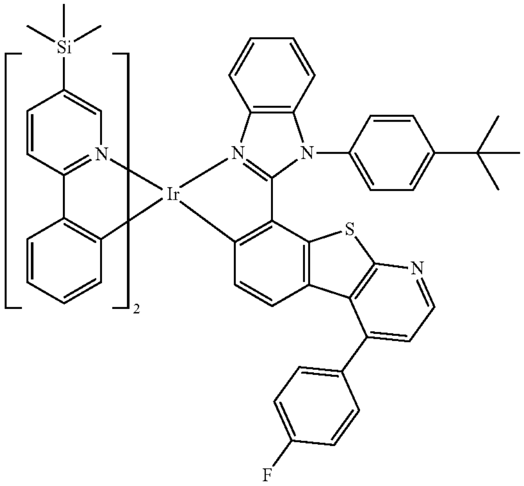
3770
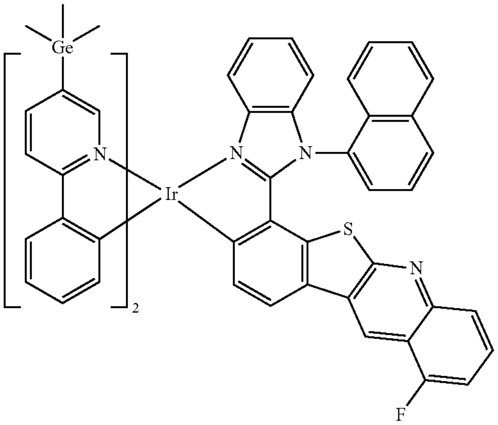
-continued
3771
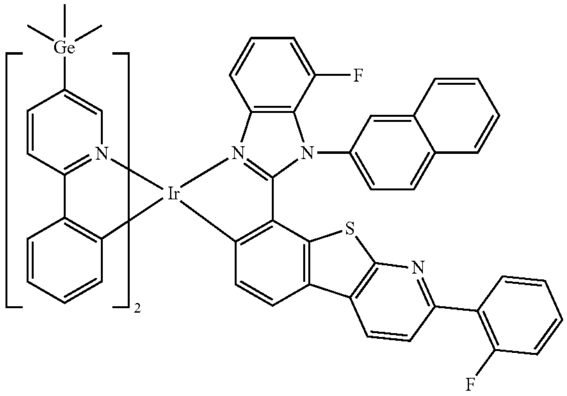
3772
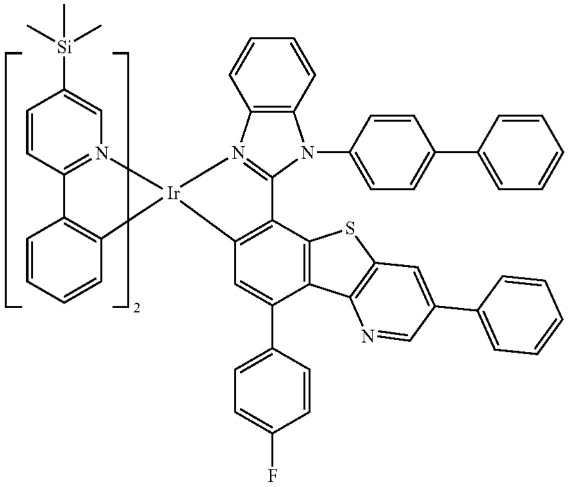
3773
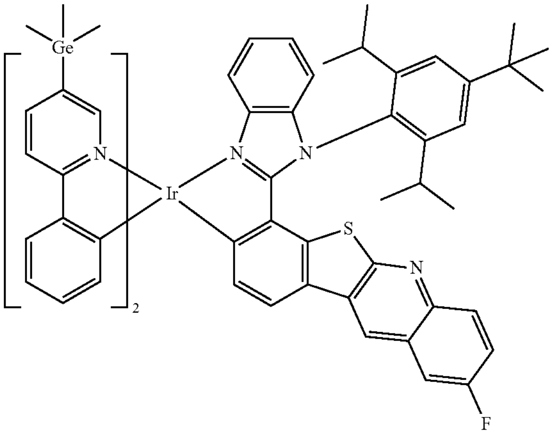

3774
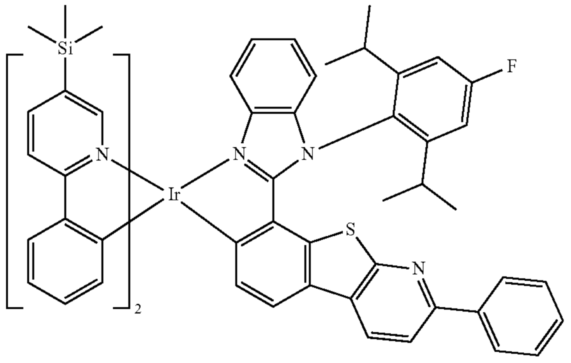
3775
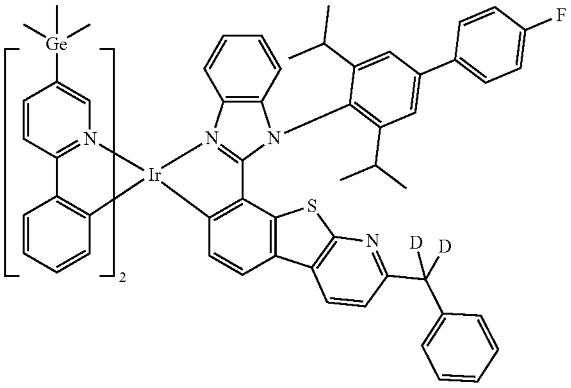
3776
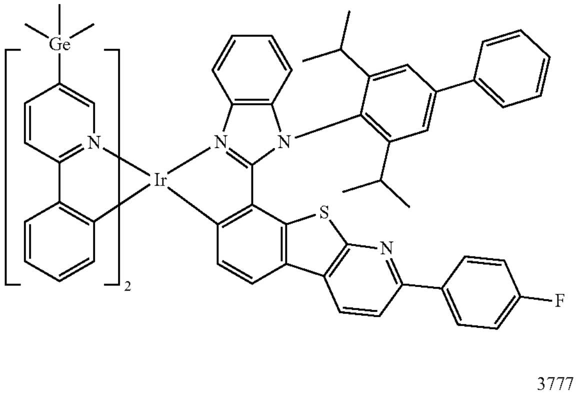
3777
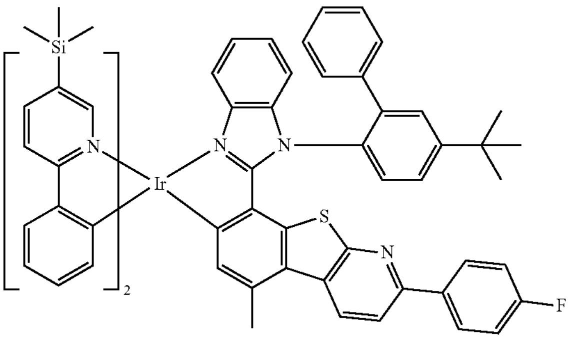
3778
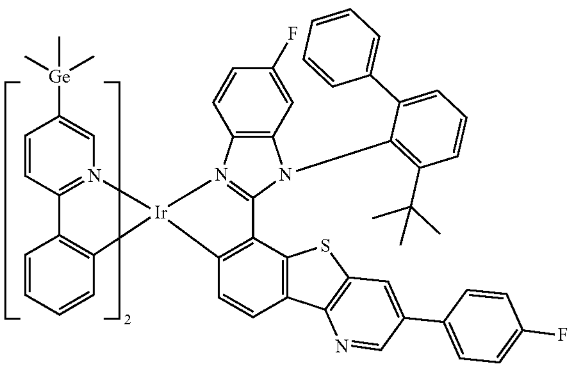
3779
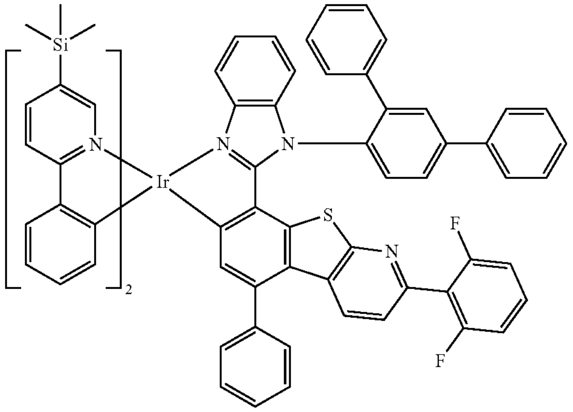
3780
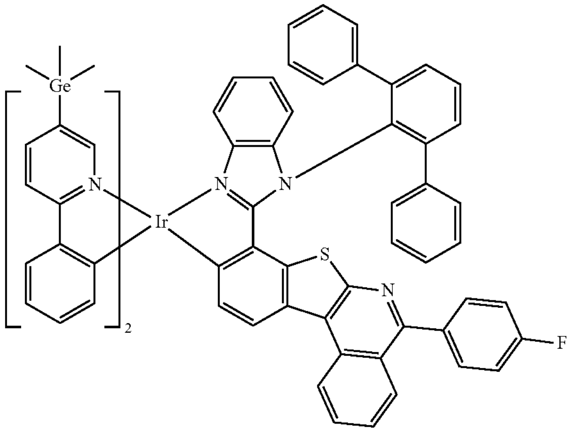

-continued
3781
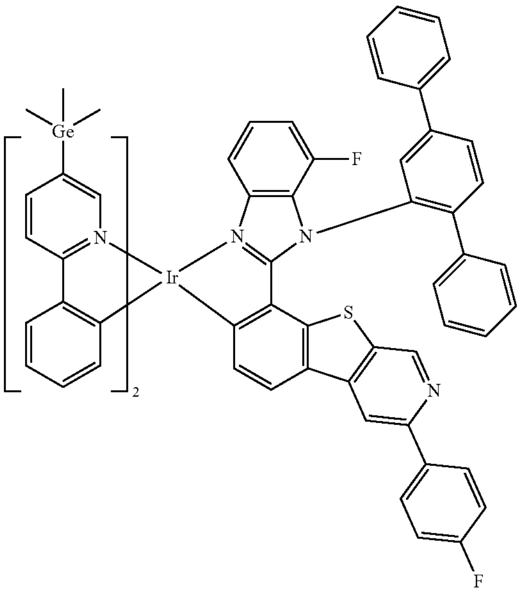
3782
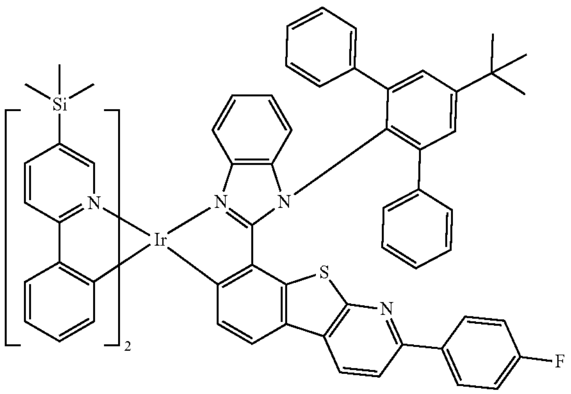
3783
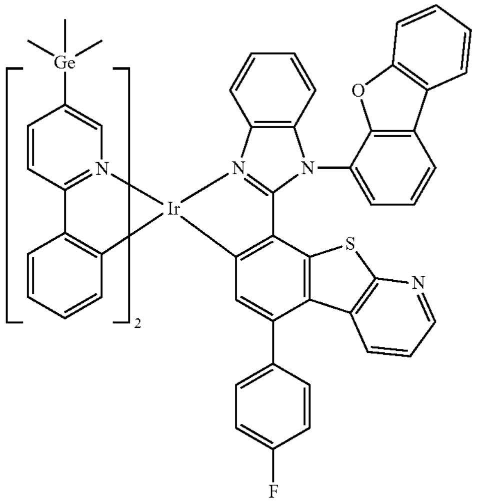
-continued
3784
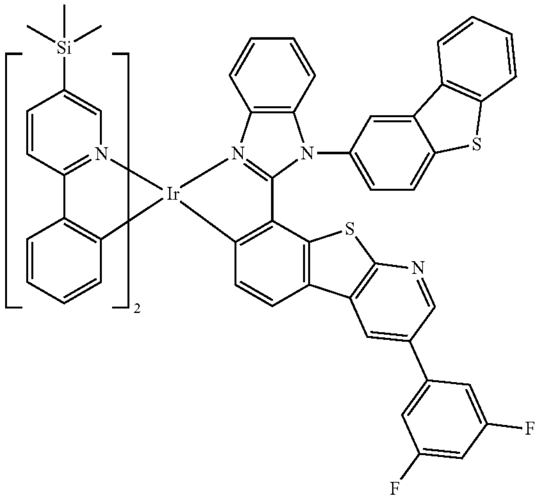
3785
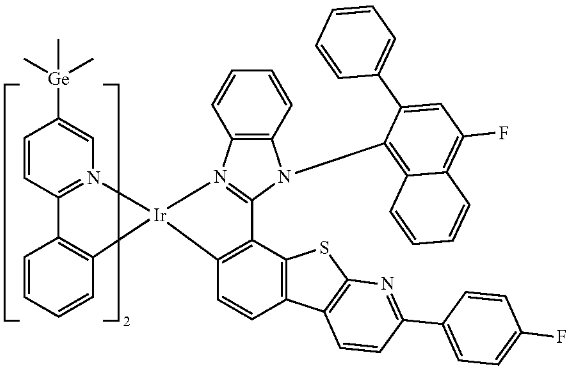
3786
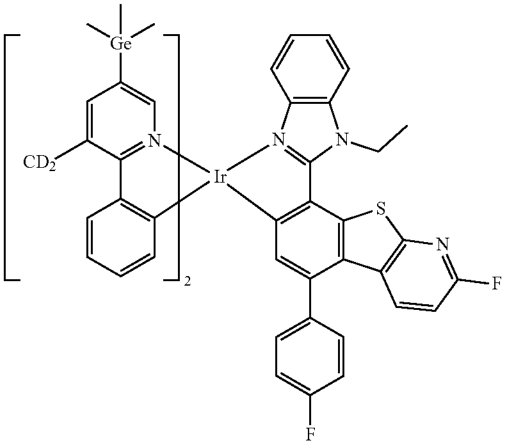

-continued
3787
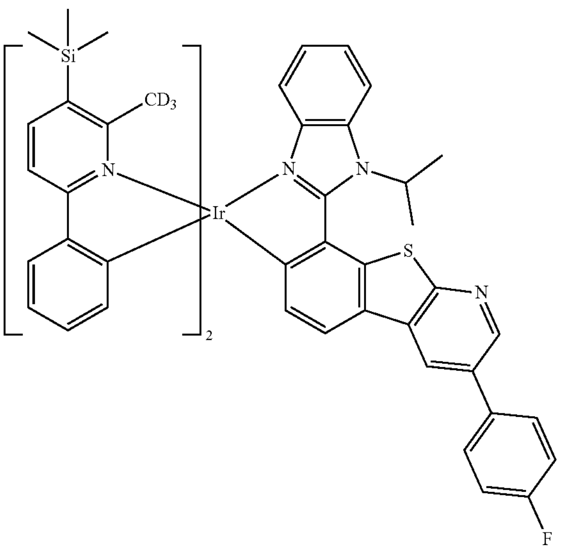
3788
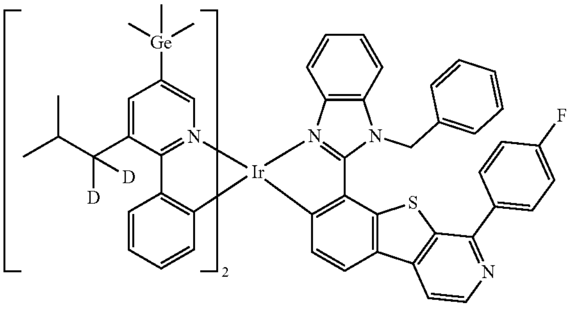
3789
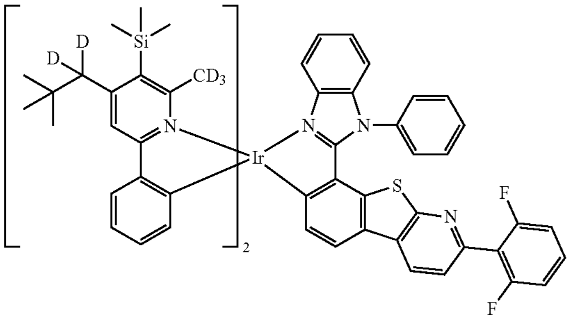
-continued
3790
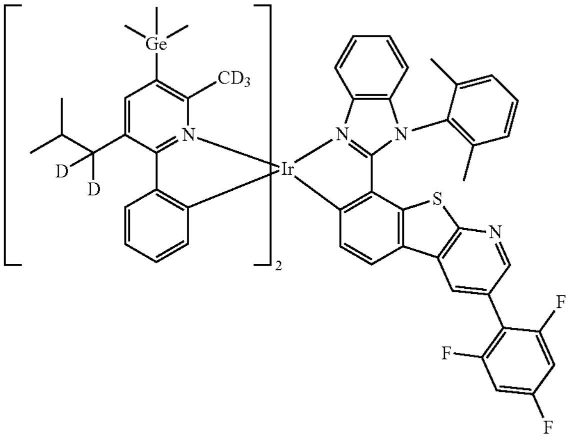
3791
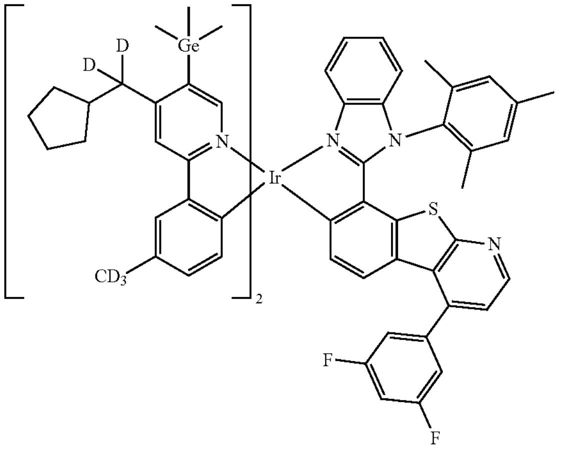
3792
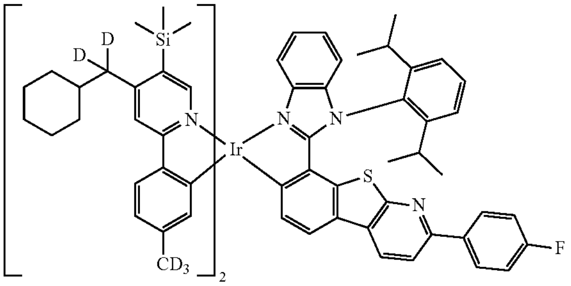

3793
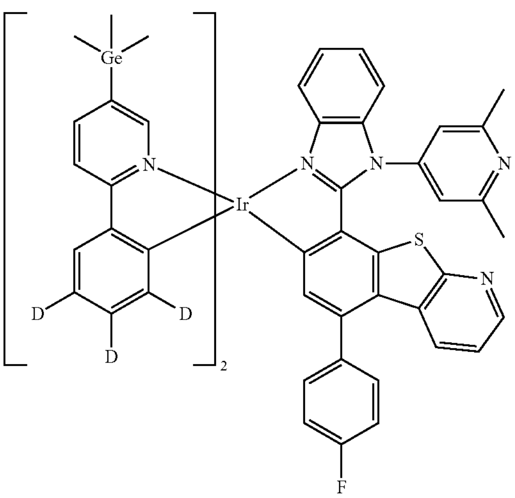
3794
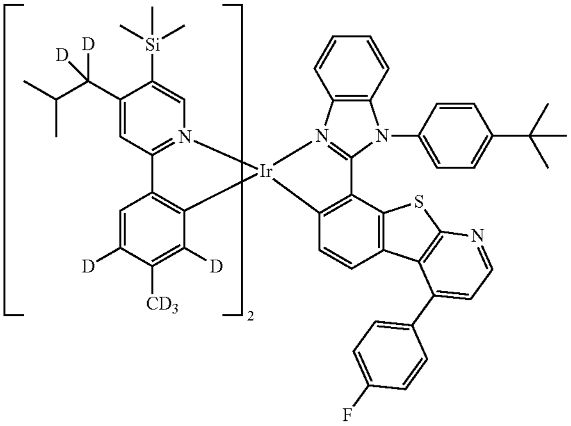
3795
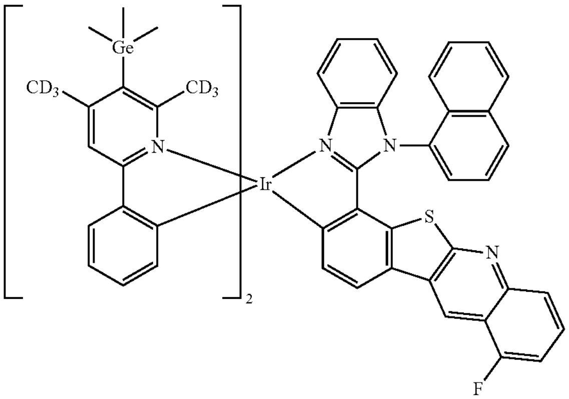
3796
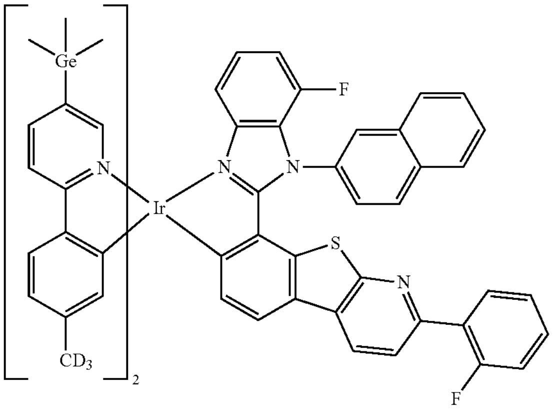
3797
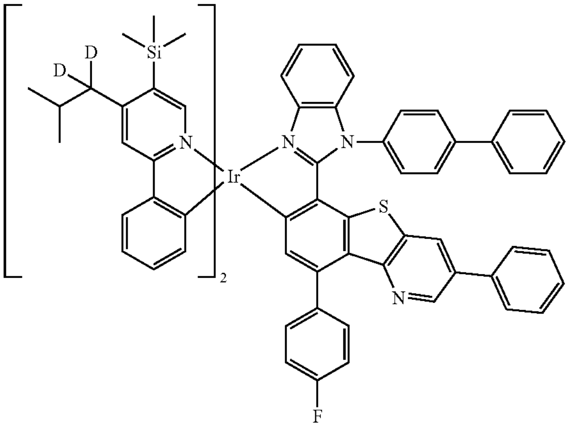
3798
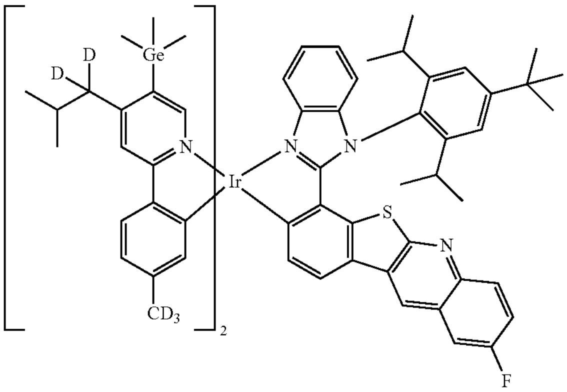

3799
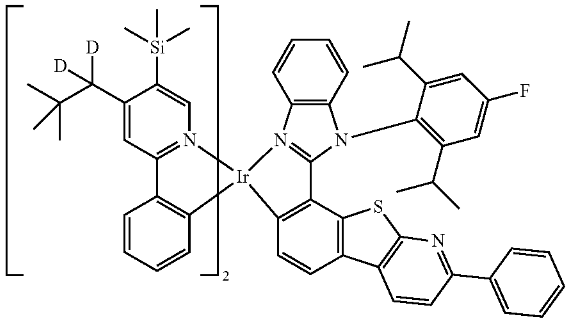
3800
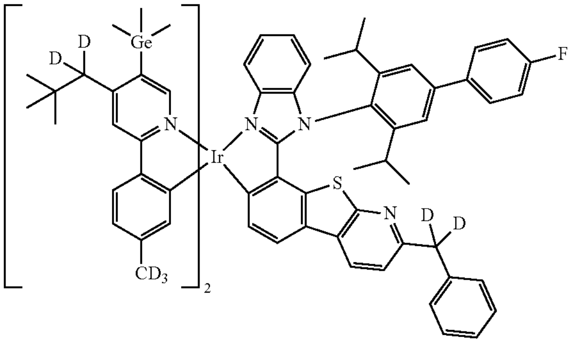
3801
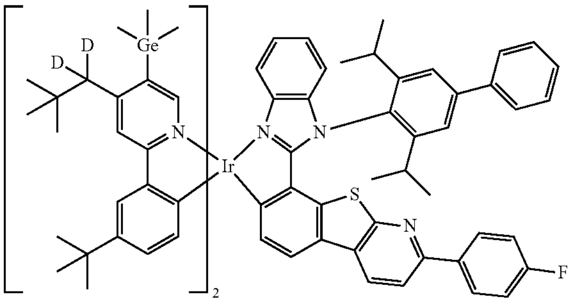
3802
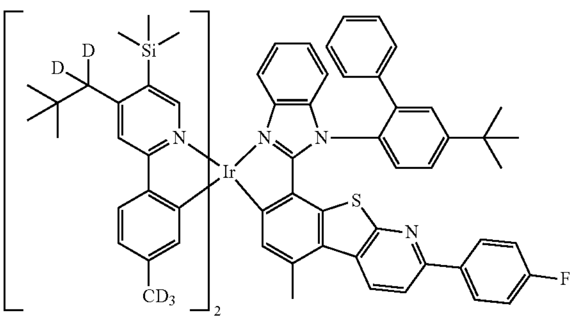
-continued
3803
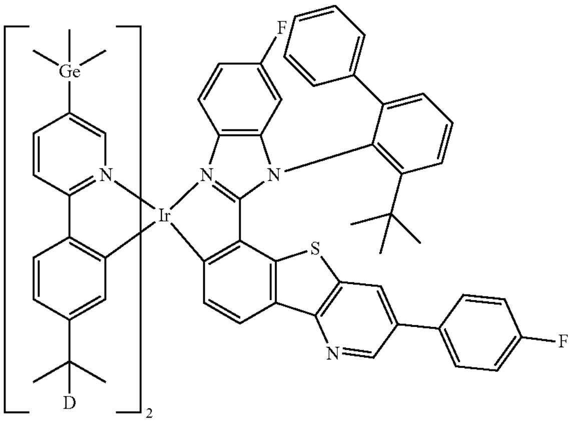
3804
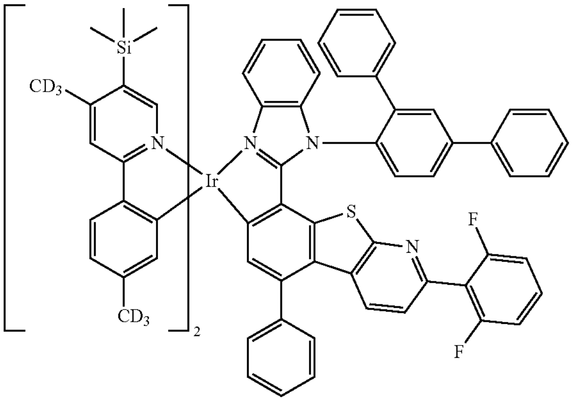
3805
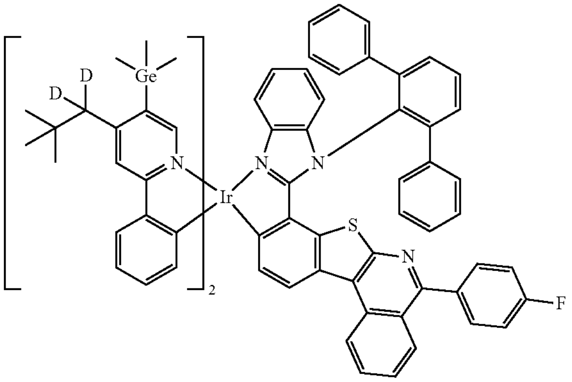

-continued
3806
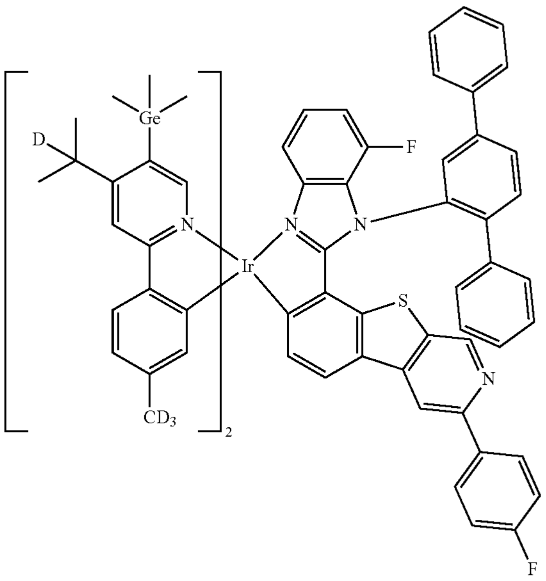
3807
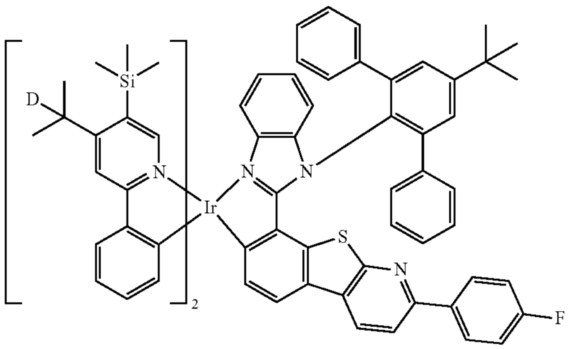
3808
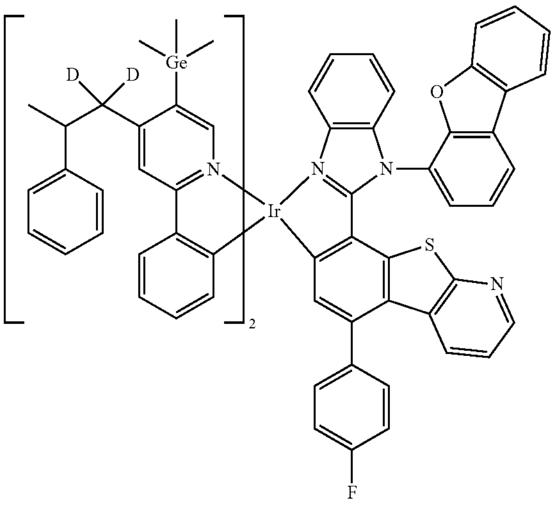
-continued
3809
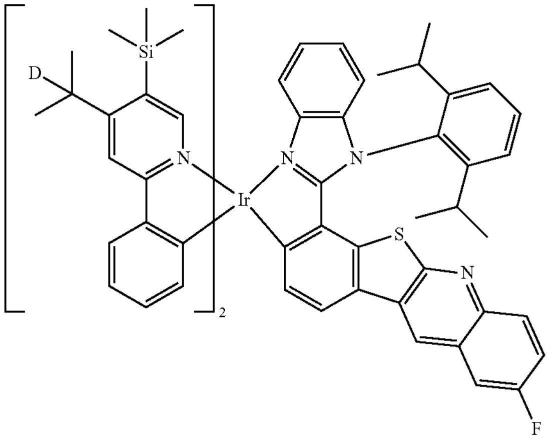
3810
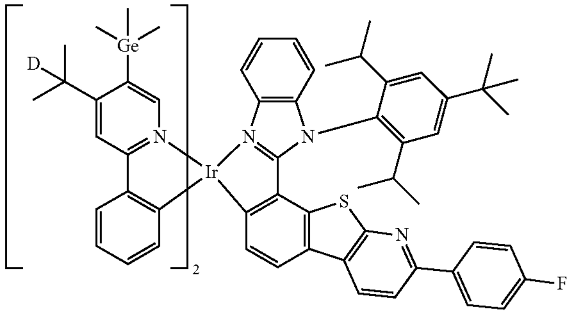
3811
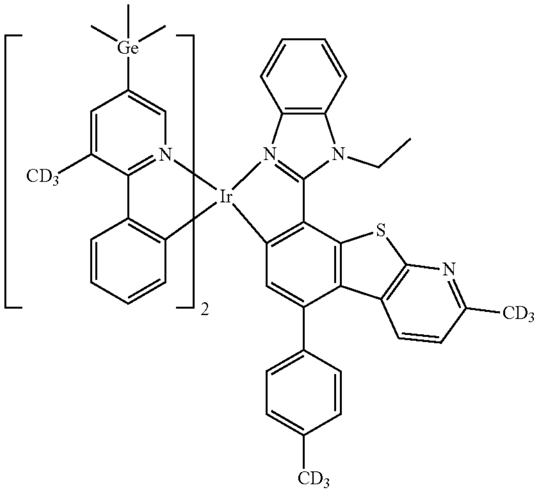

3812
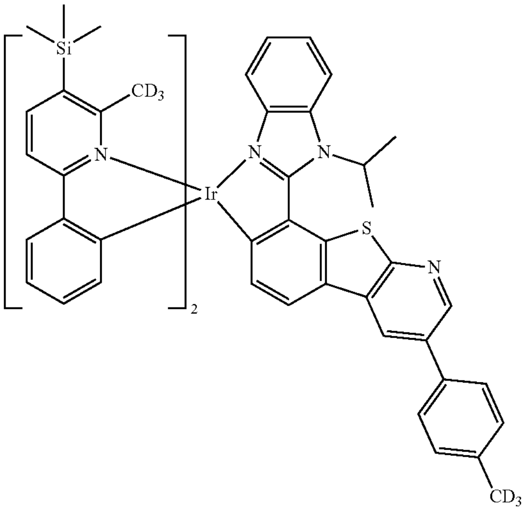
3813
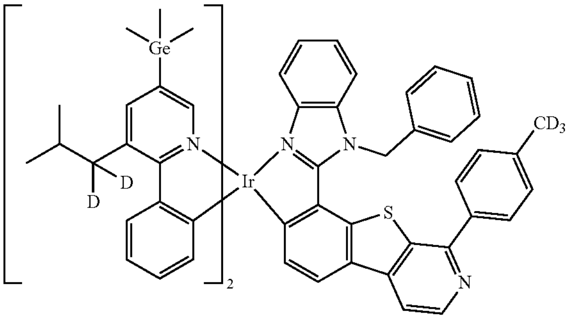
3814
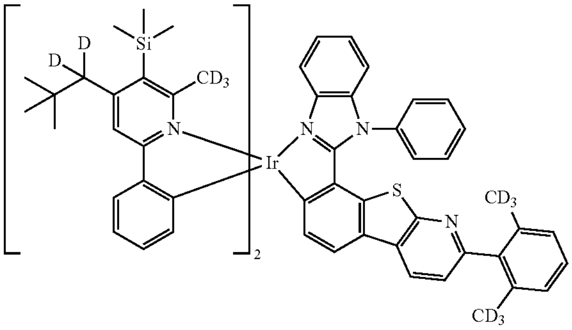
3815
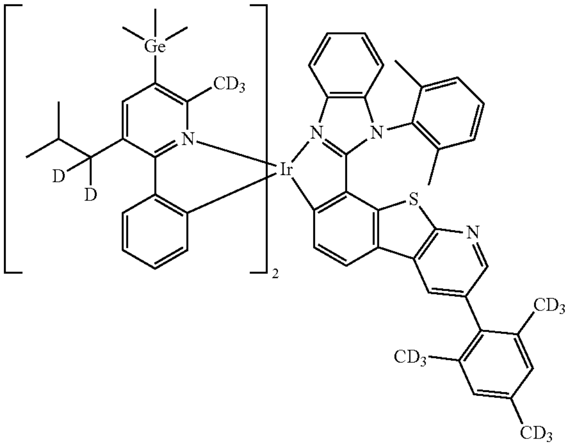
3816
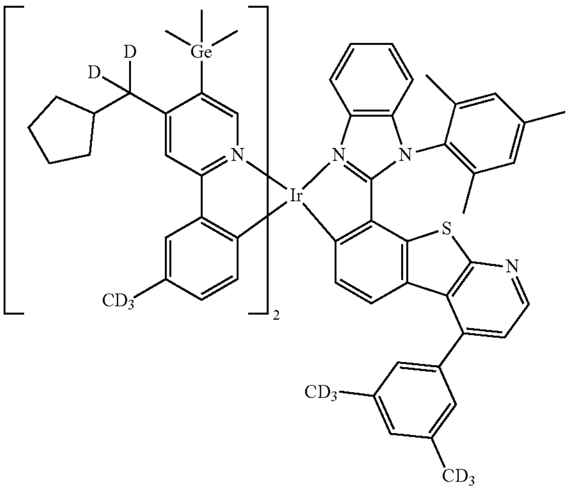
3817
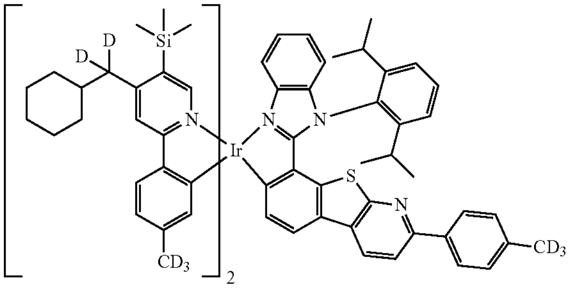

-continued
3818
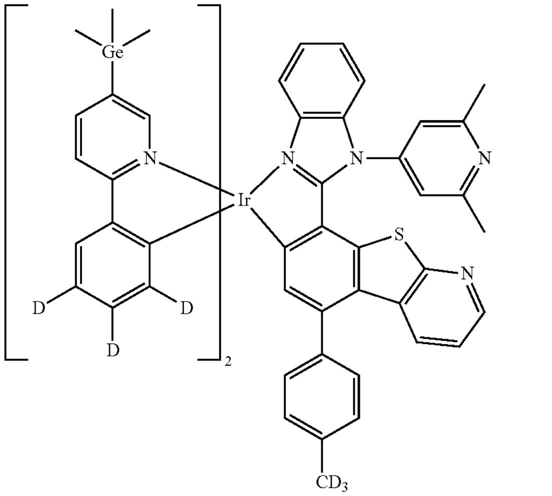
3819
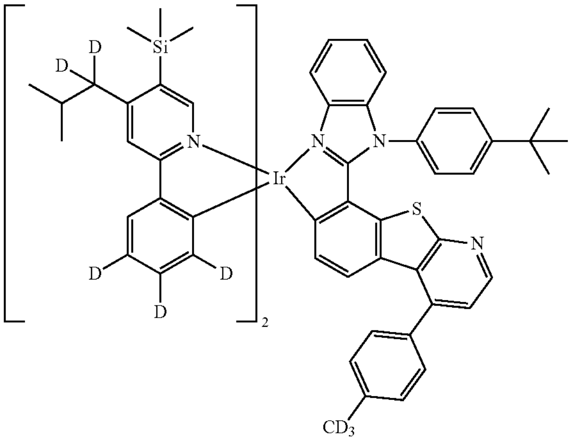
3820
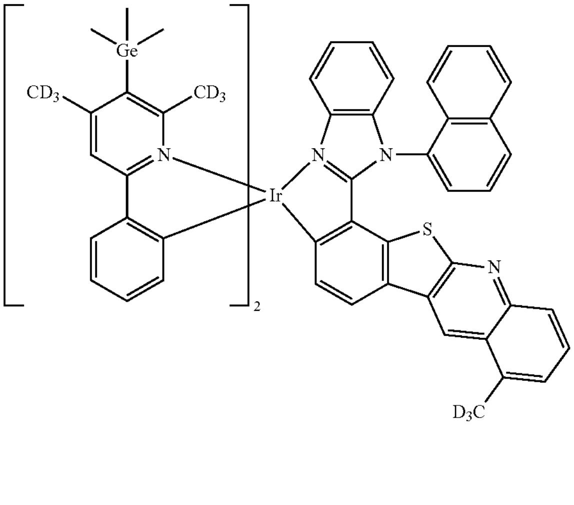
-continued
3821
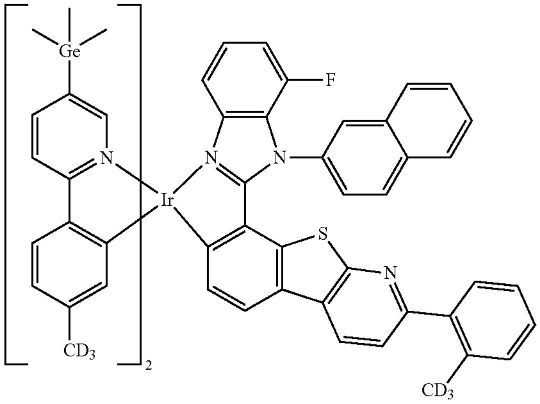
3822
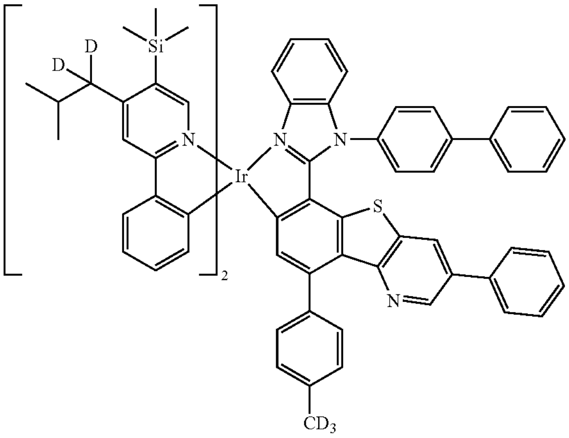
3823
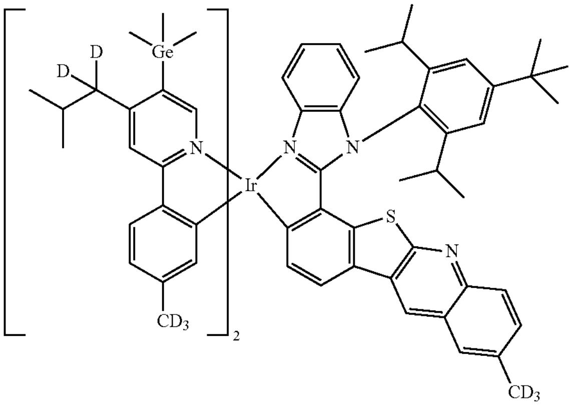

3824
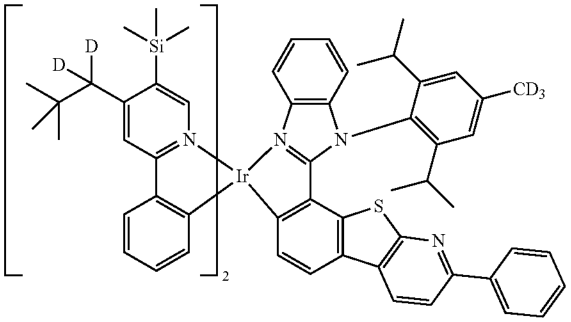
3825
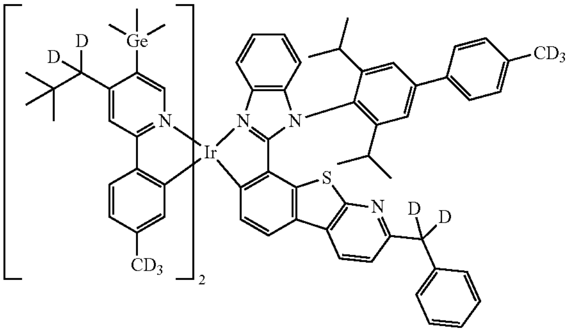
3826
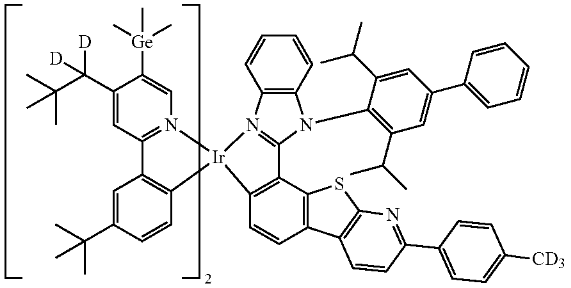
3827
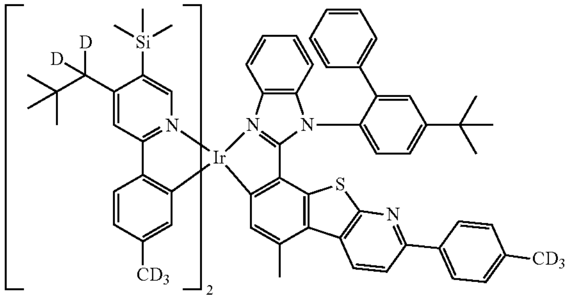
3828
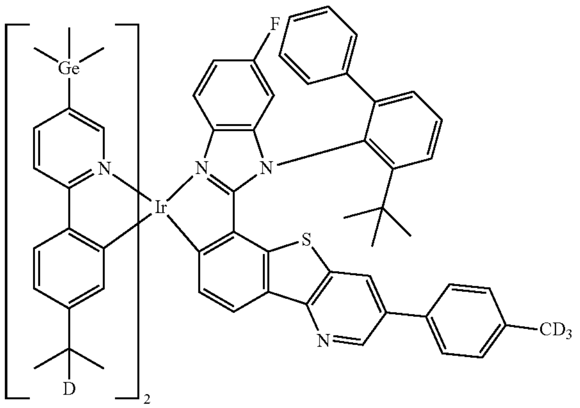
3829
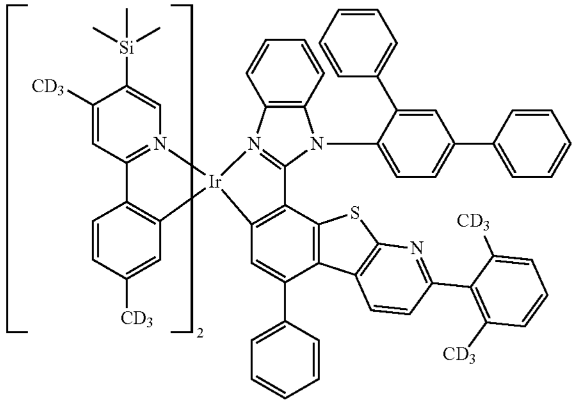
3830
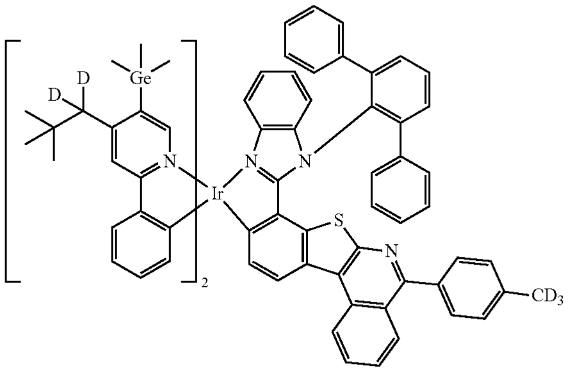

-continued
3831
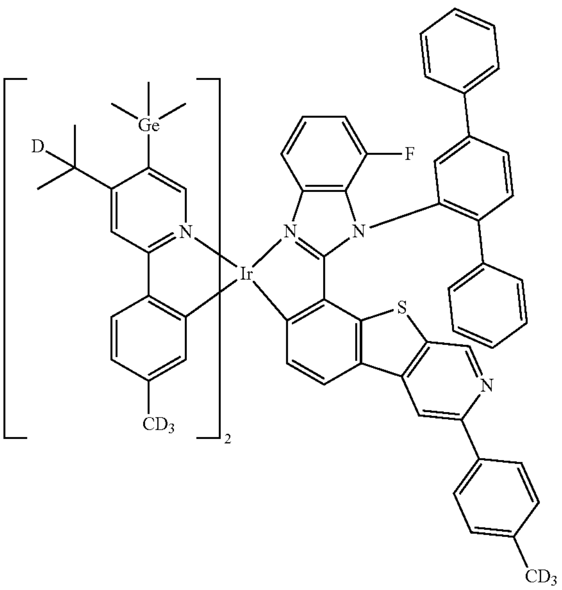
3832
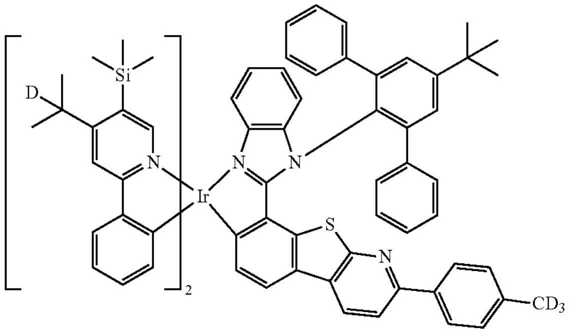
3833
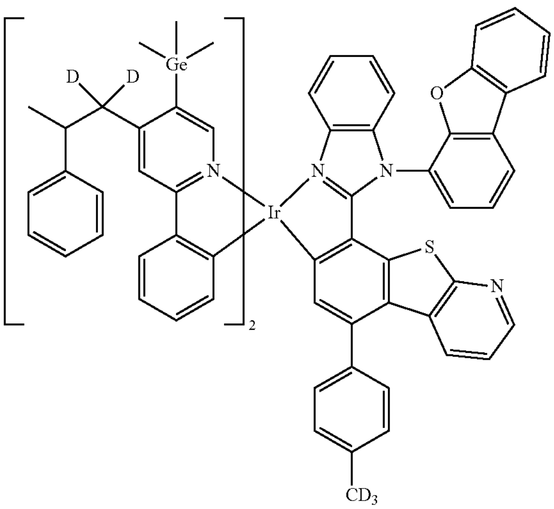
-continued
3834
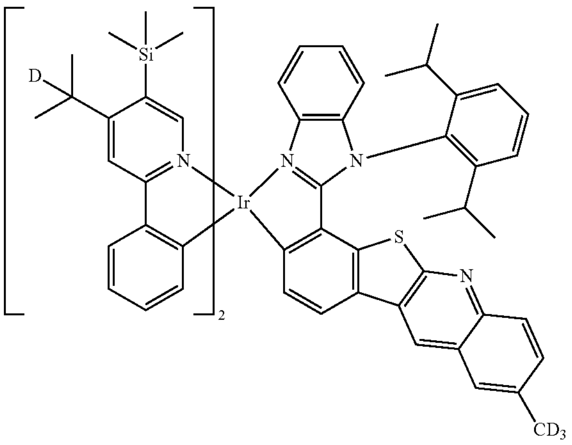
3835
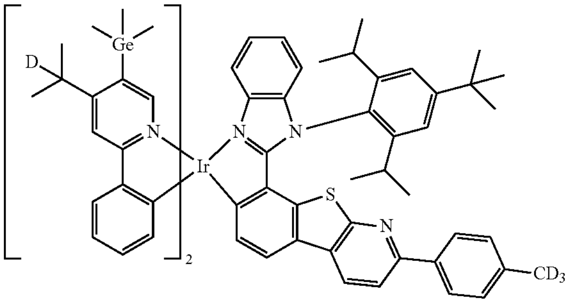
3836
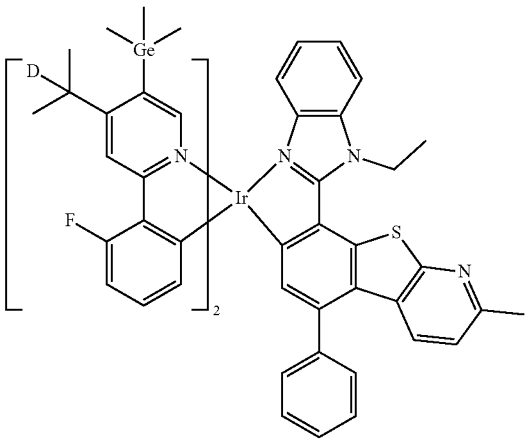

-continued
3837
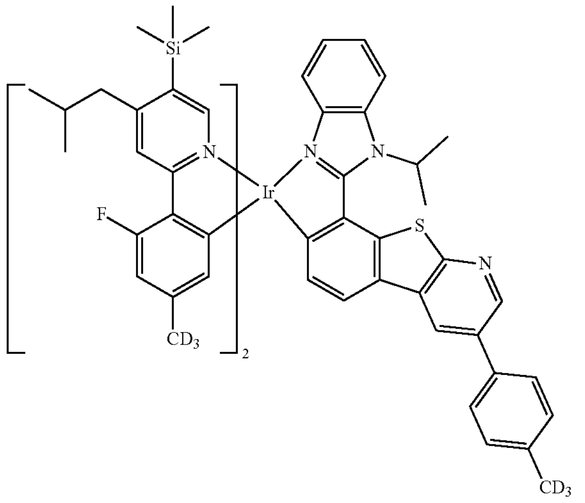
3838
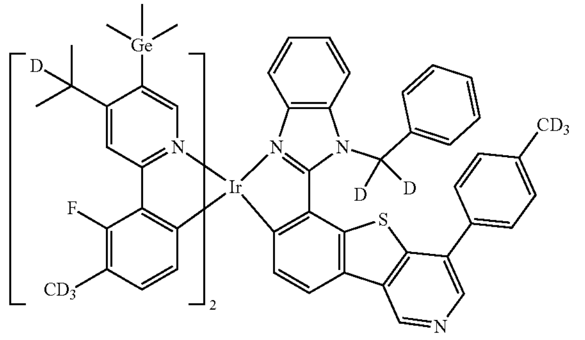
3839
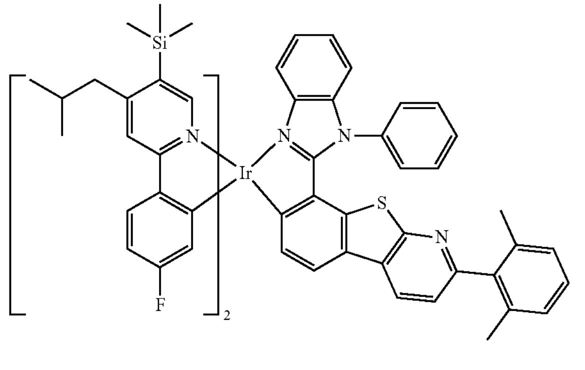
-continued
3840
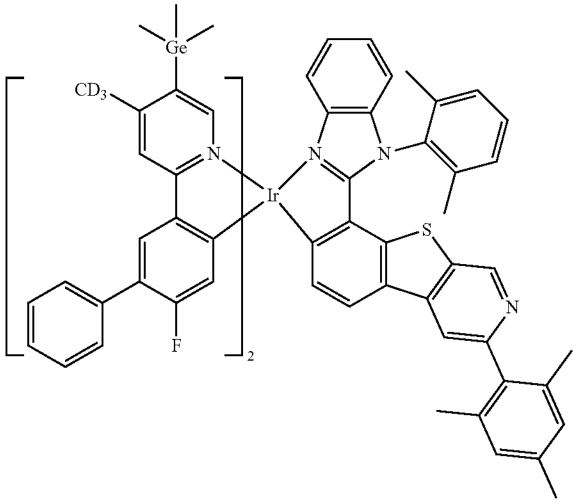
3841
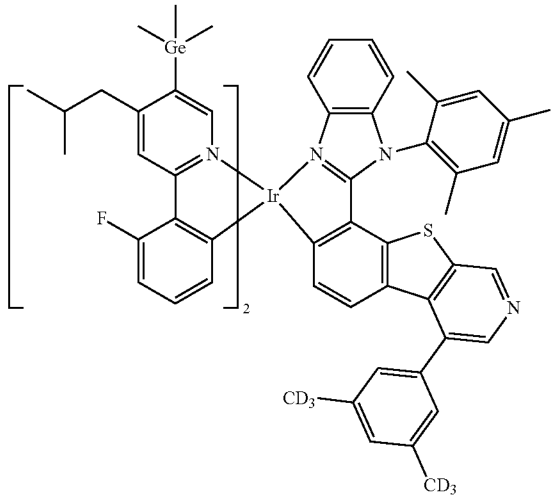
3842
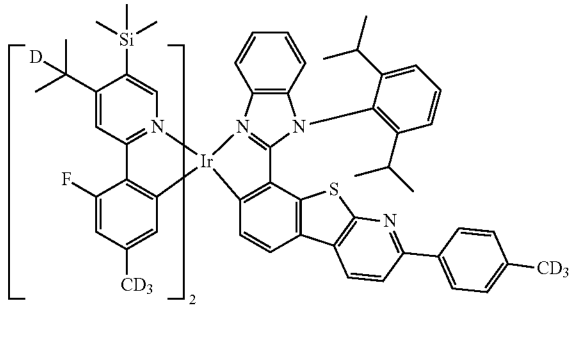

-continued
3843
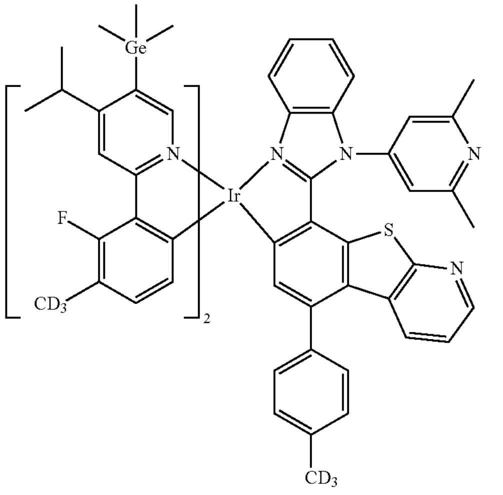
3844
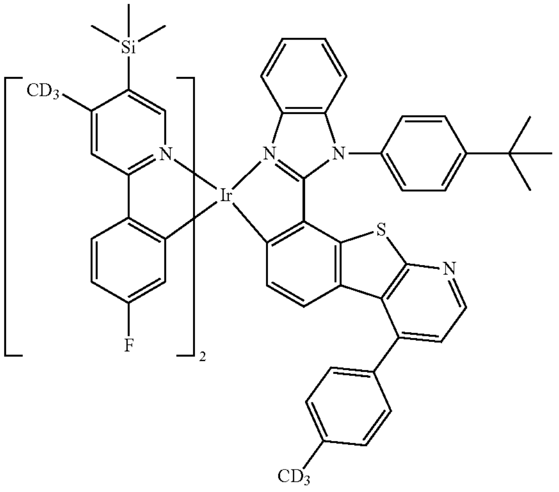
3845
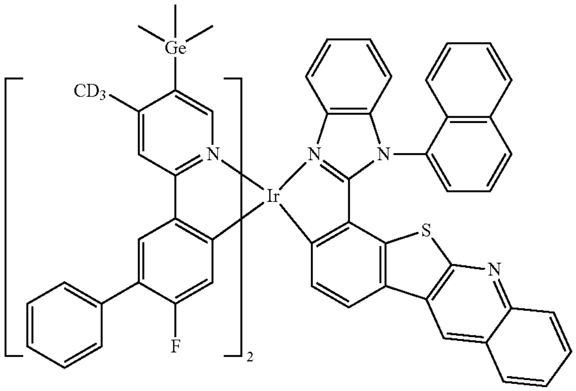
-continued
3846
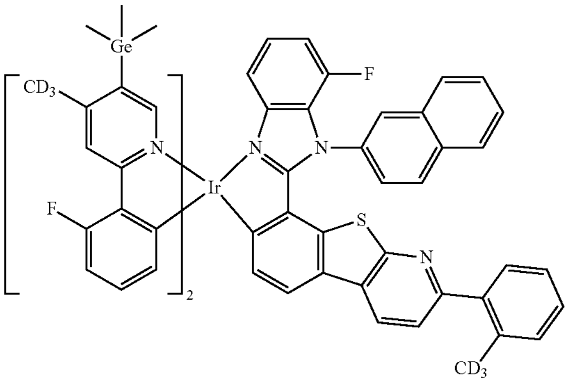
3847
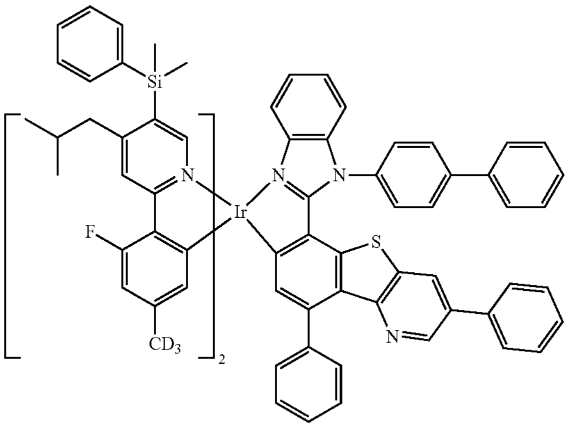
3848
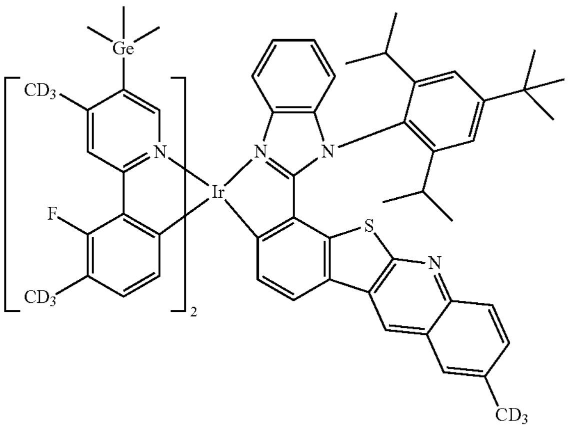

3849
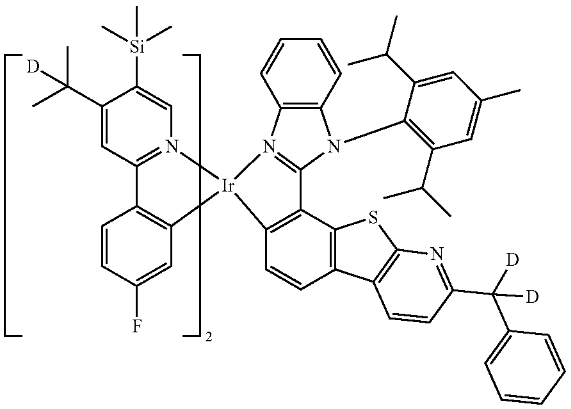
3850
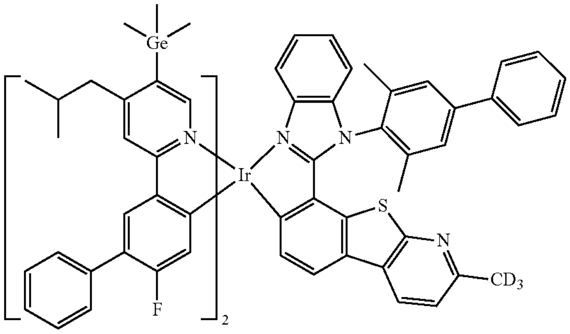
3851
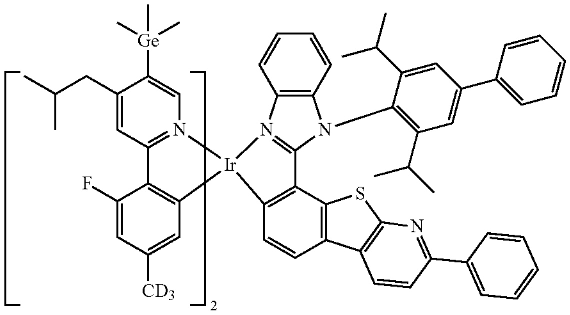
3852
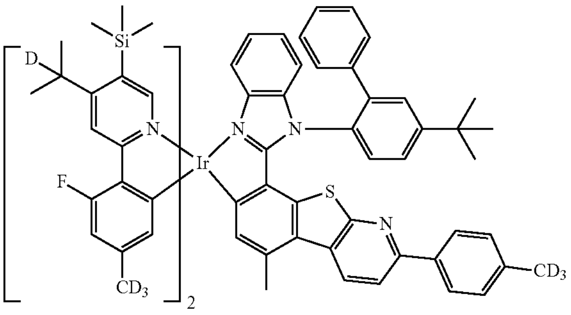
3853
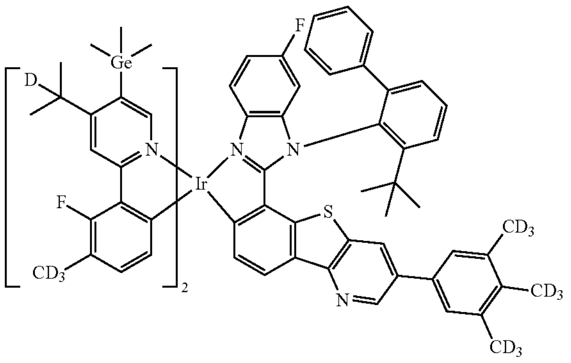
3854
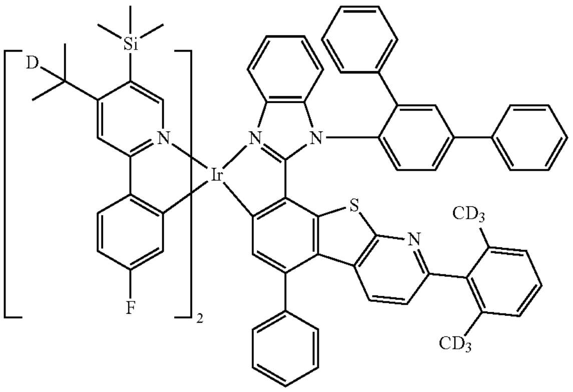
3855
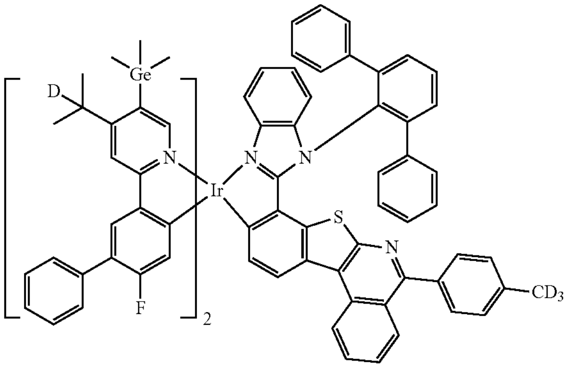

3856
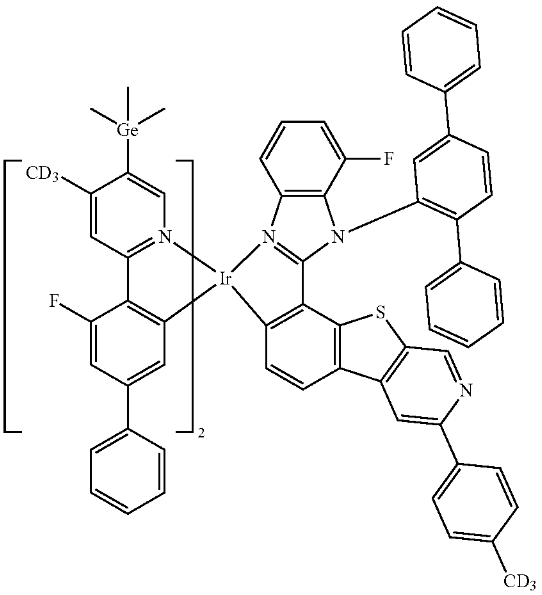
3857
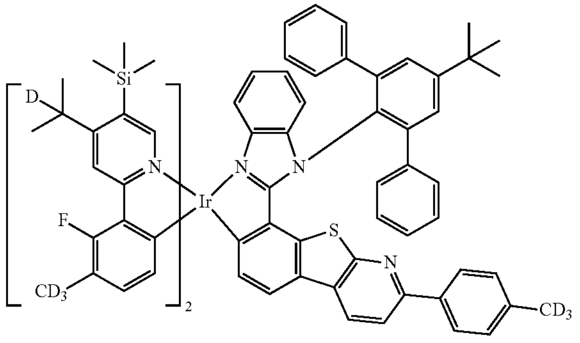
3858
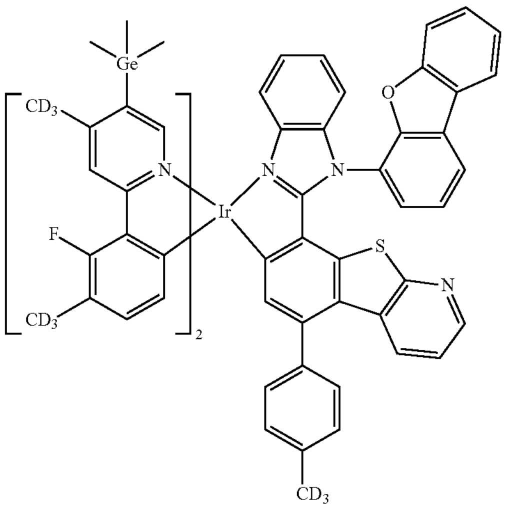
3859
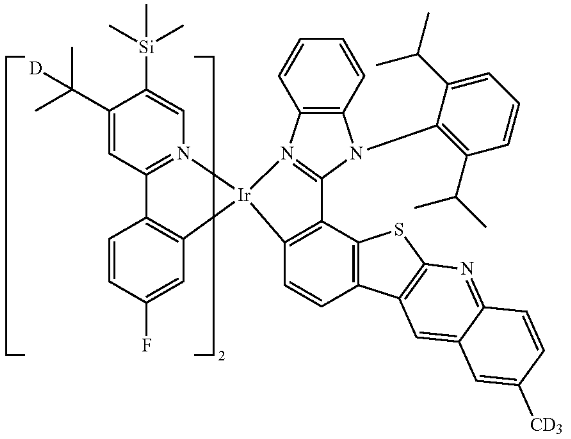
3860
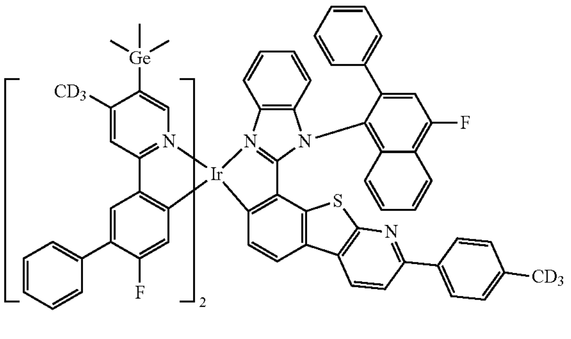
3861
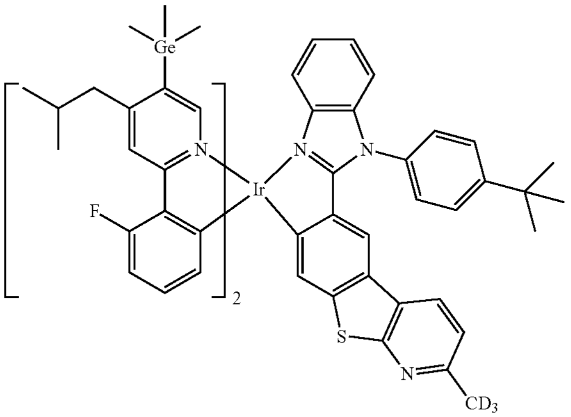

-continued
3862
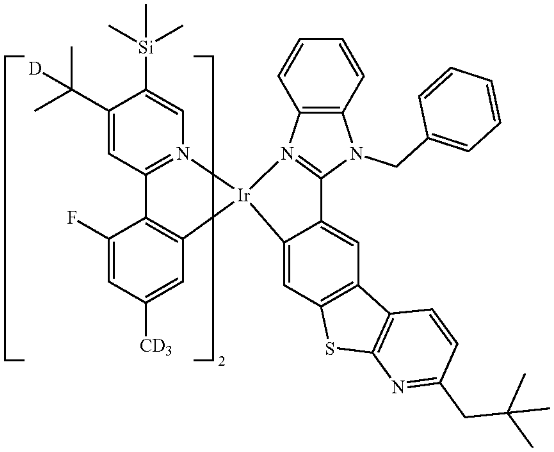
3863
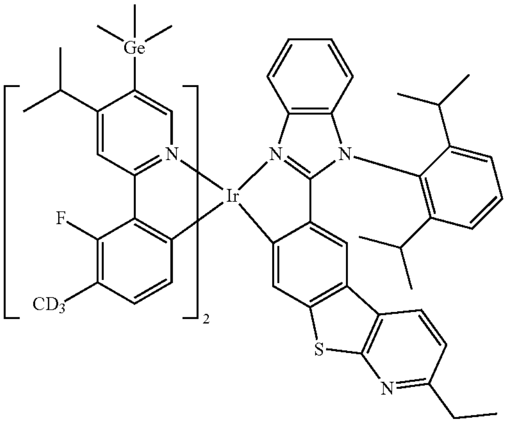
3864
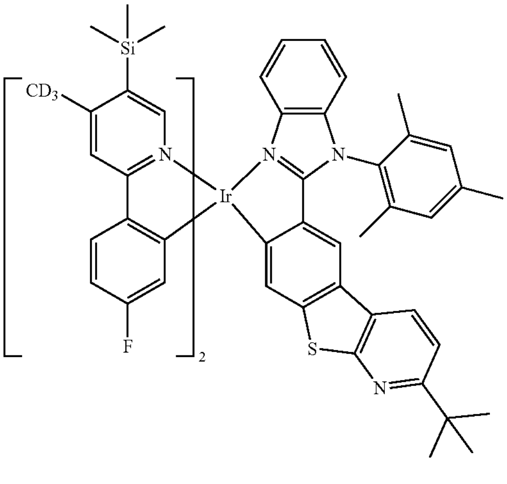
-continued
3865
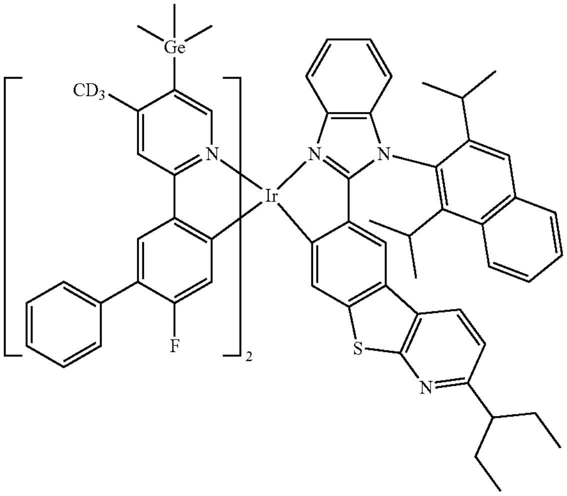
3866
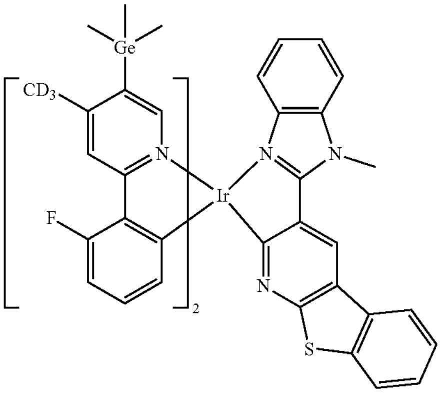
3867
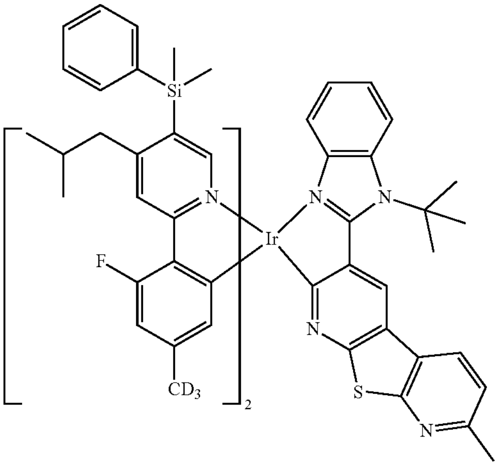

-continued
3868
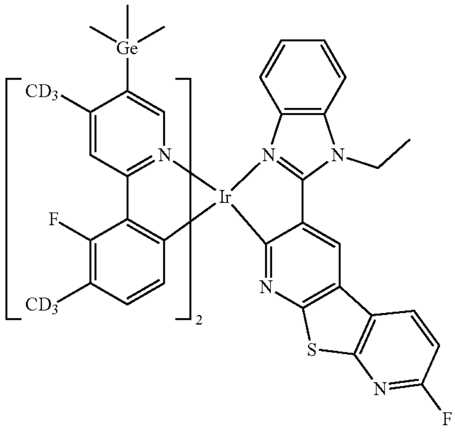
3869
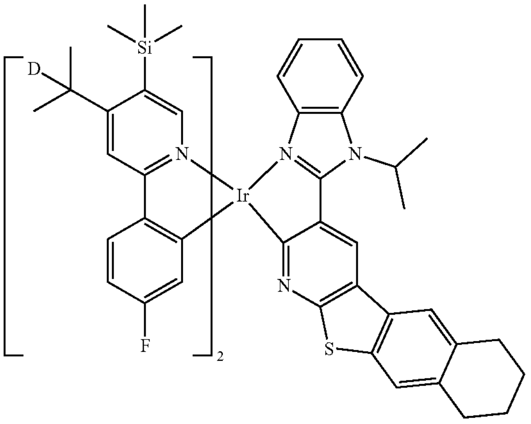
3870
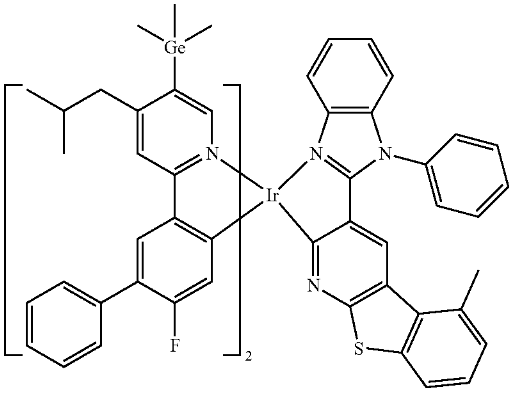
-continued
3871
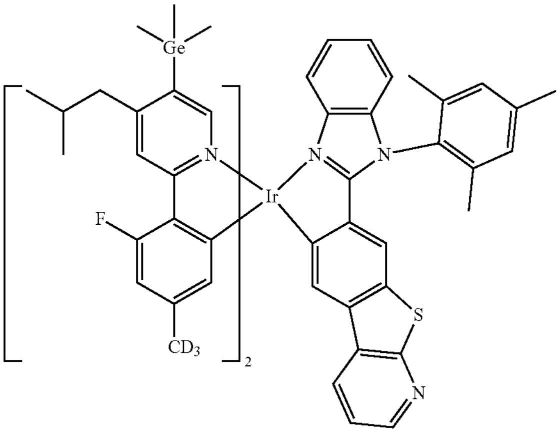
3872
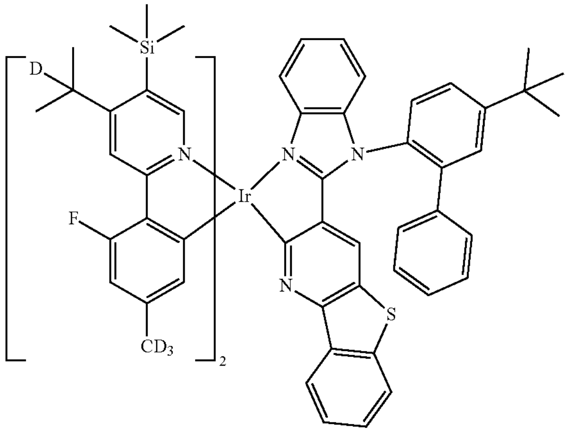
3873
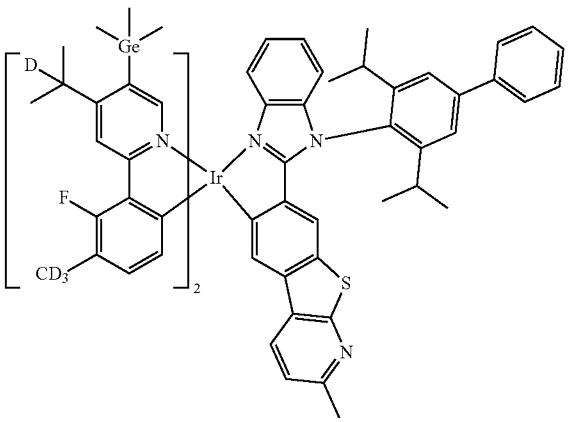

-continued
3874
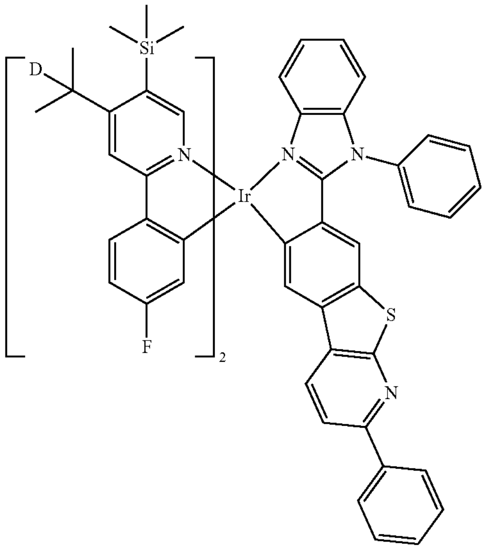
3875
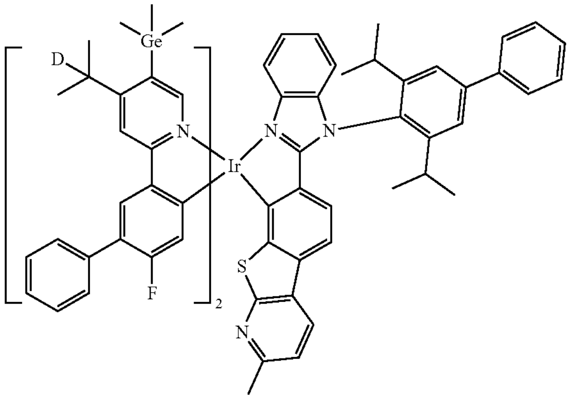
3876
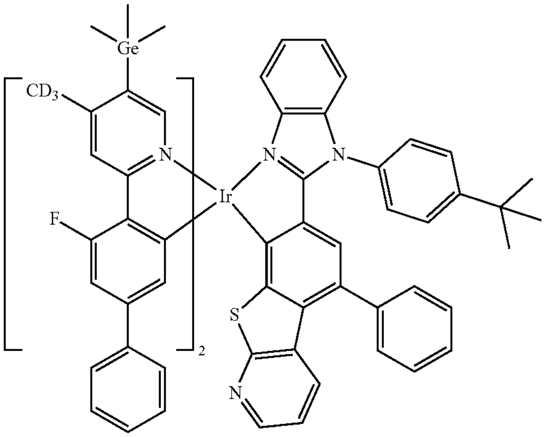
-continued
3877
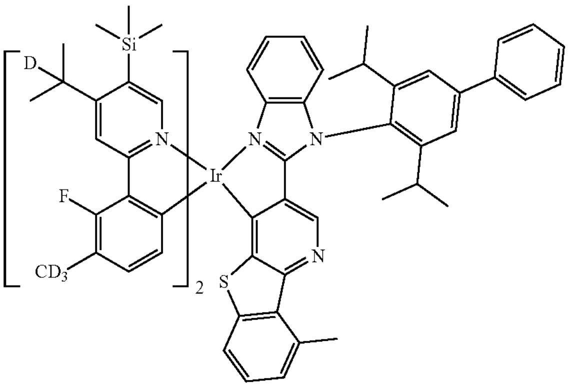
3878
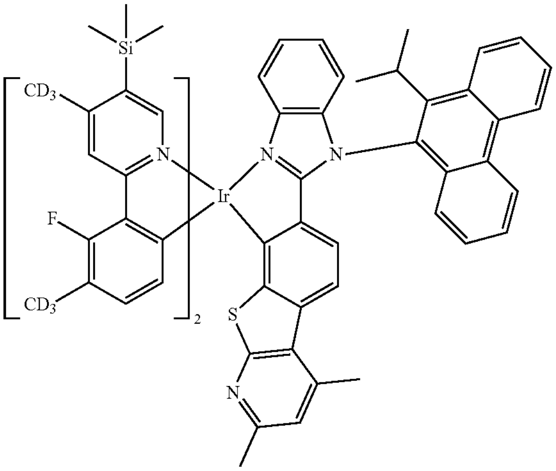
3879
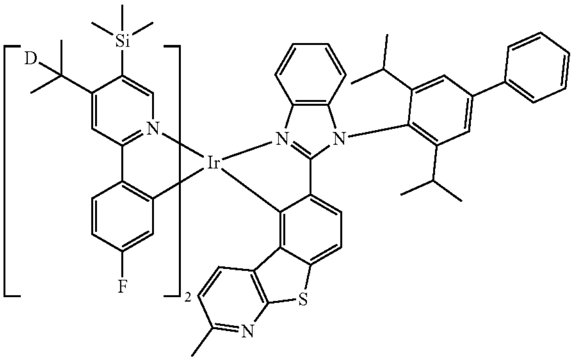
3880
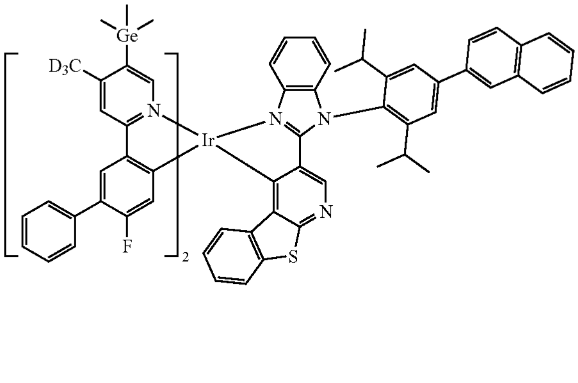

-continued
3881
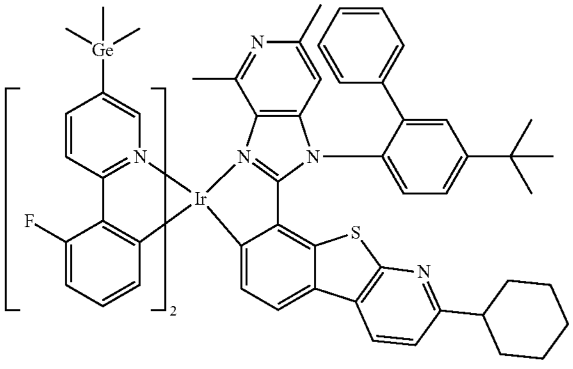
3882
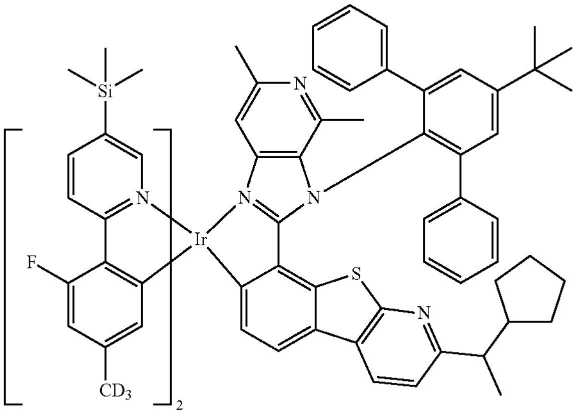
3883
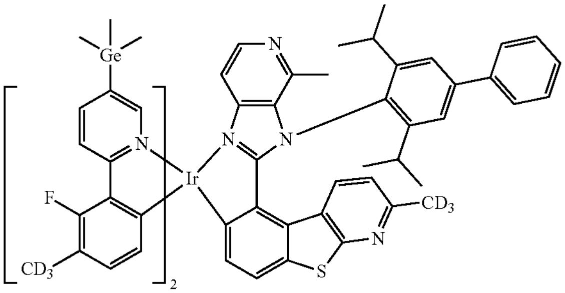
3884
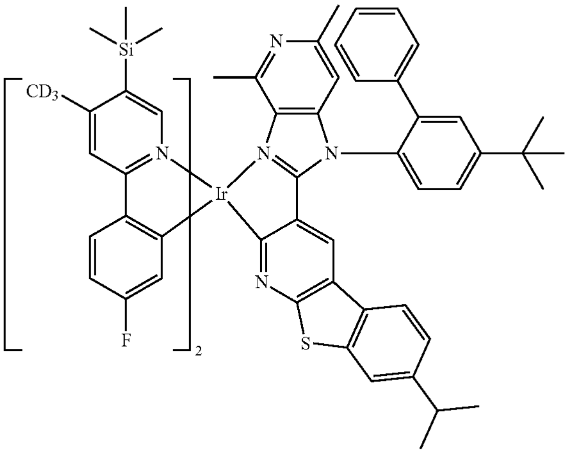
-continued
3885
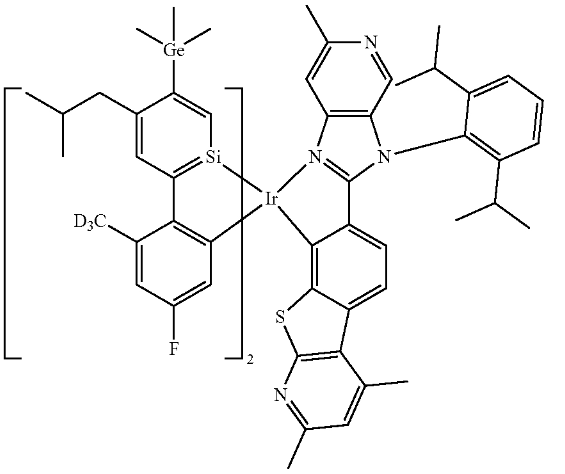
3886
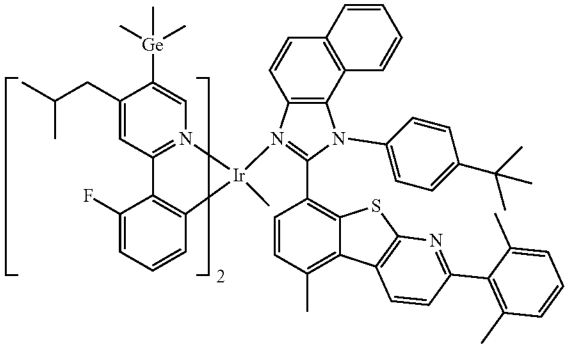
3887
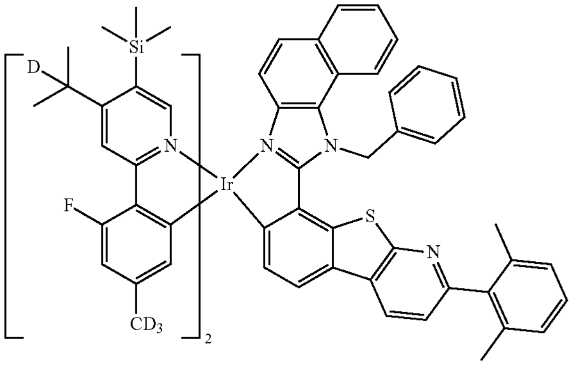
3888
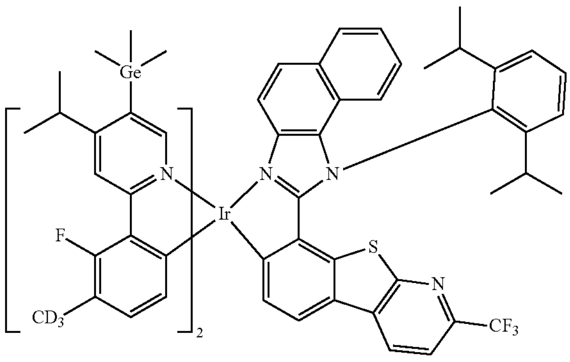

-continued
3889
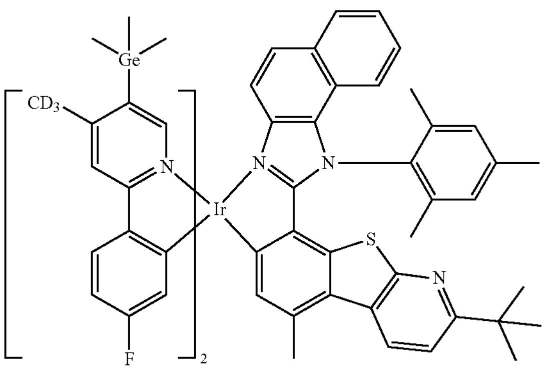
3890
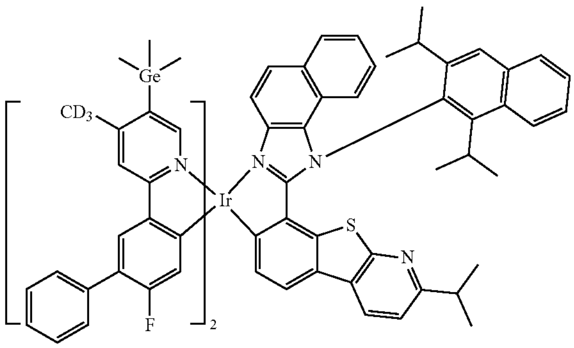
3891
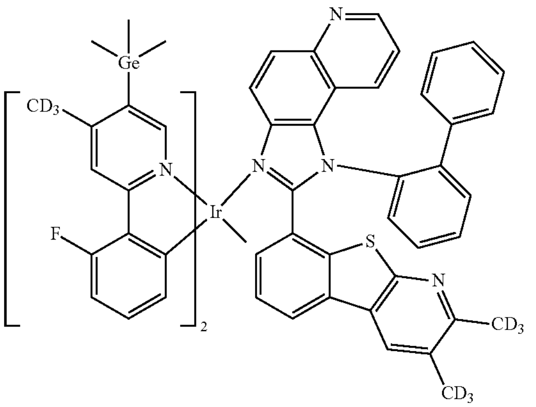
3892
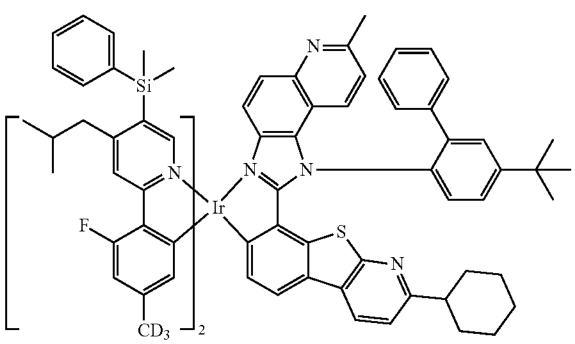
3893
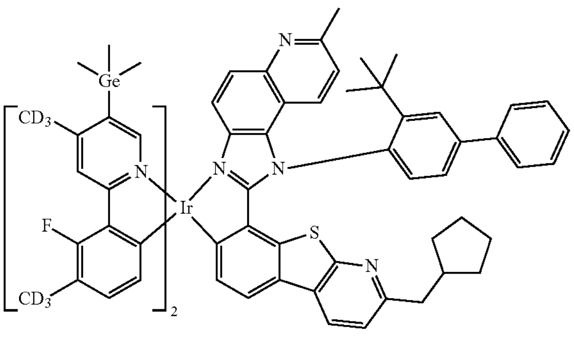
3894
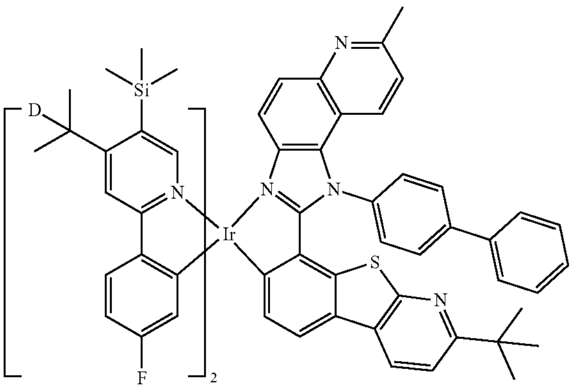
3895
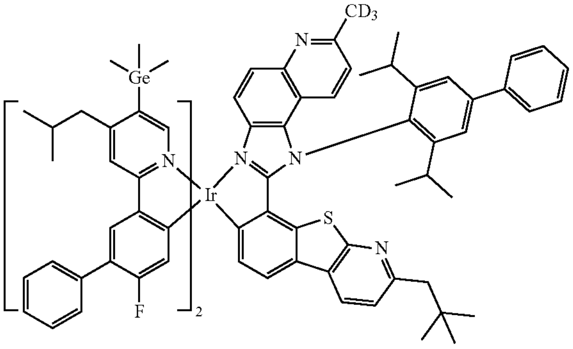
3896
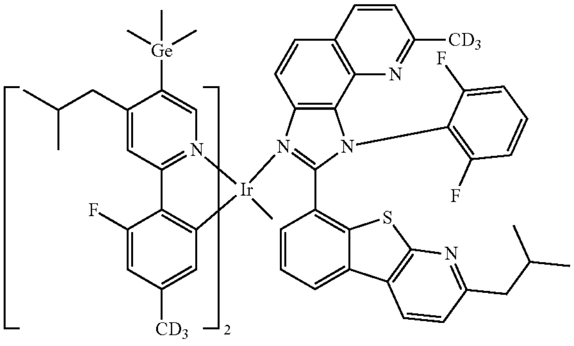

-continued
3897
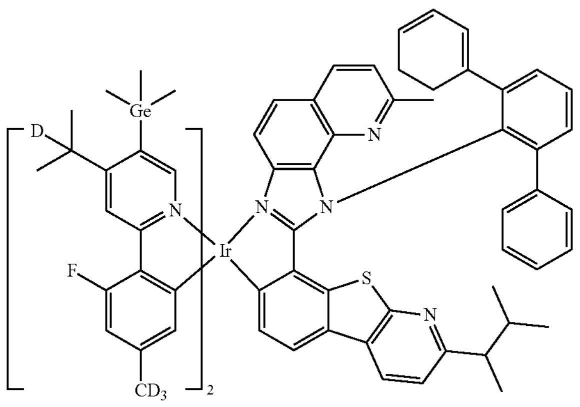
3898
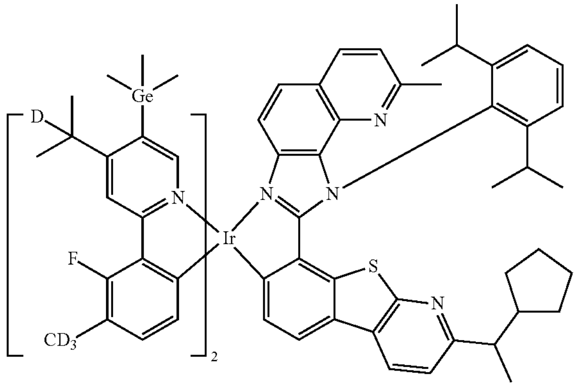
3899
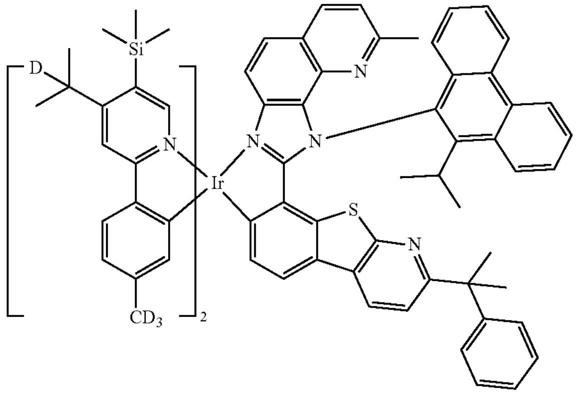
3900
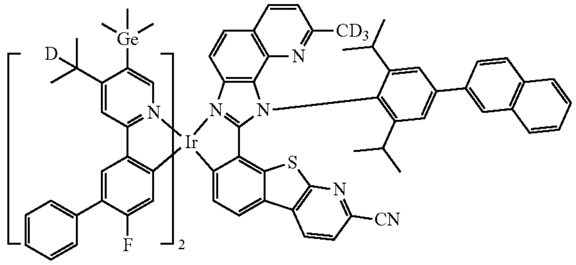
-continued
3901
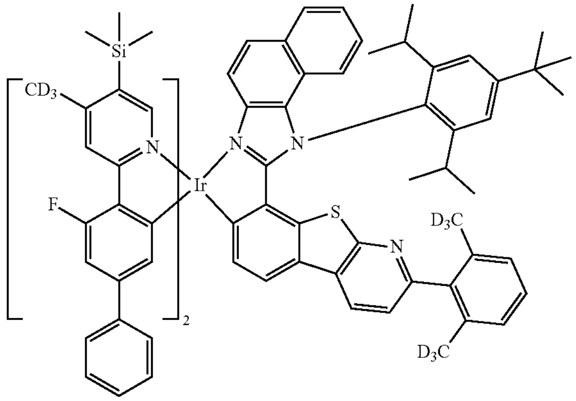
3902
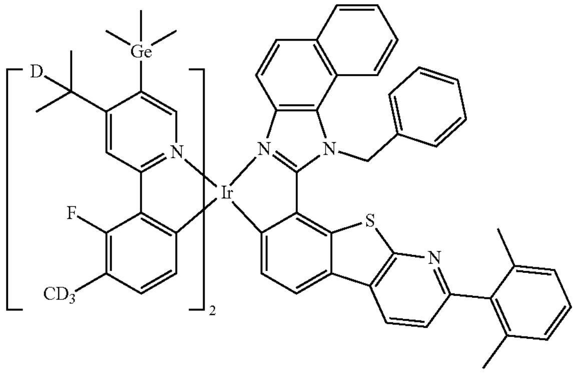
3903
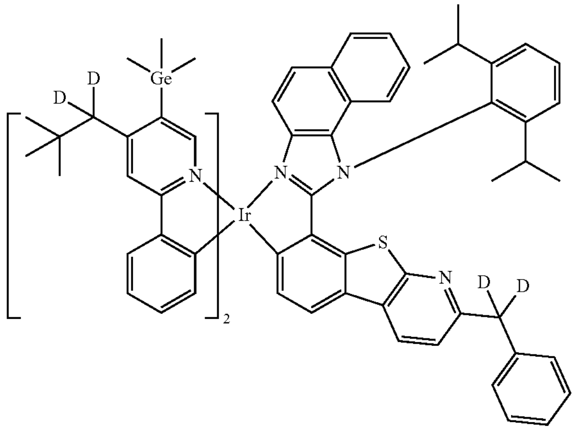
3904
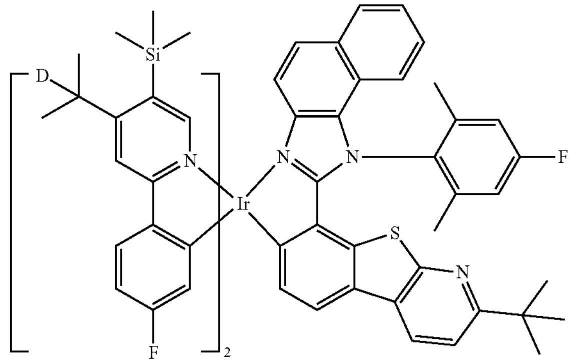

-continued
3905
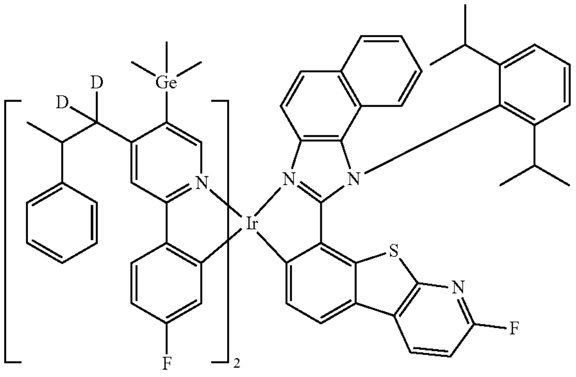
3906
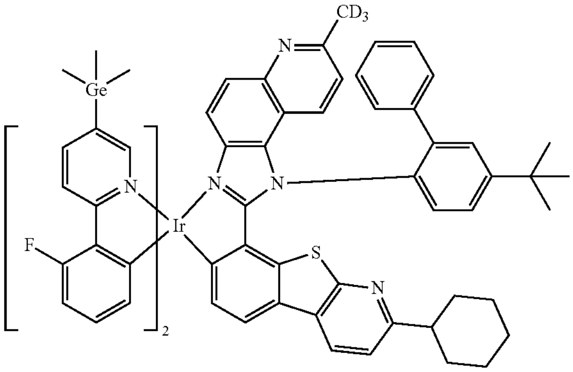
3907
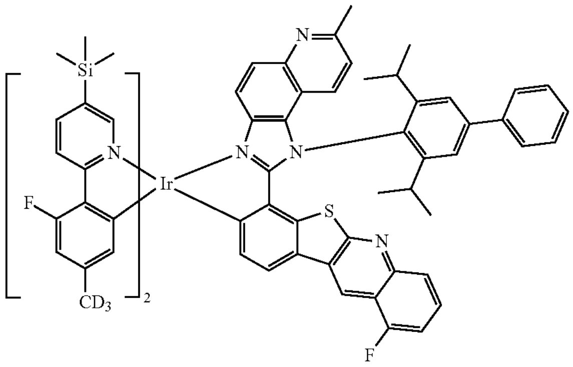
3908
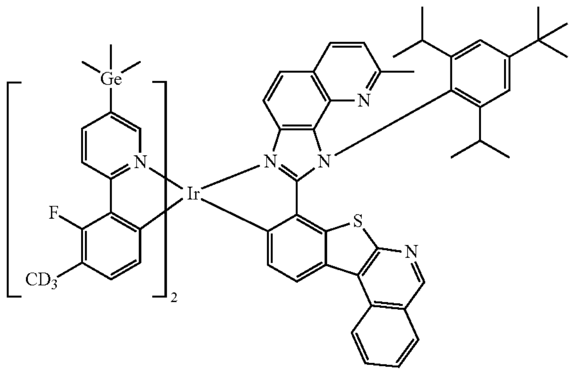
-continued
3909
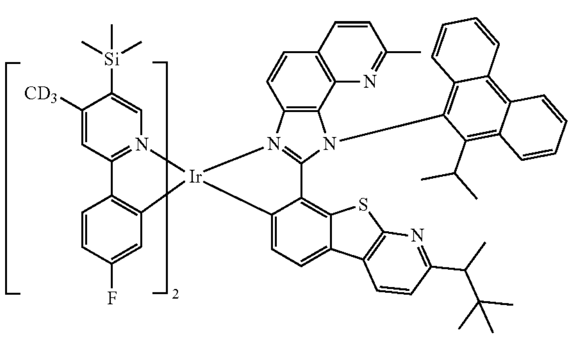
3910
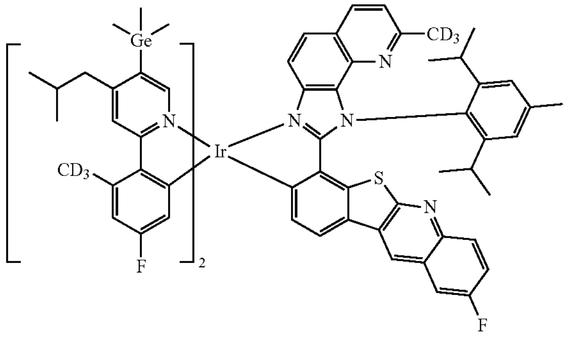
3911
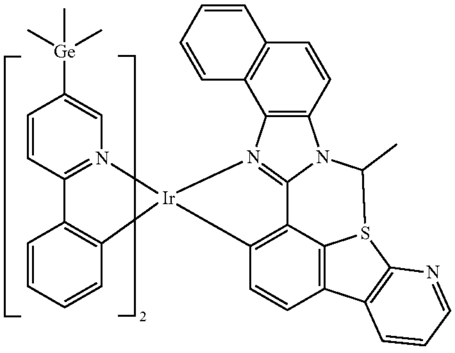
3912
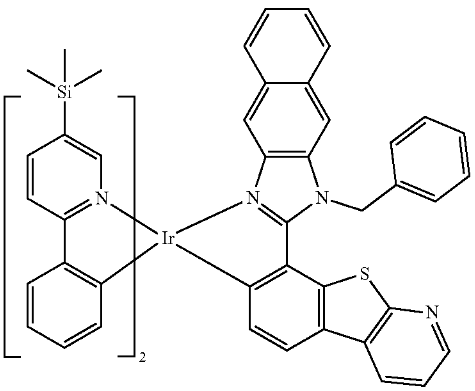

-continued
3913
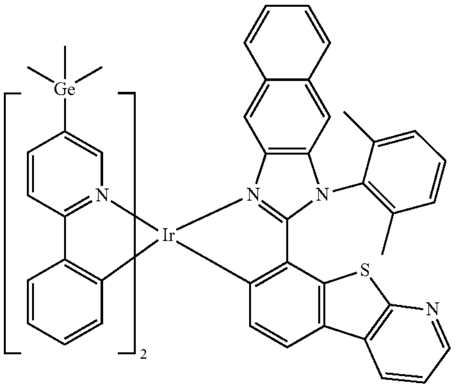
3914
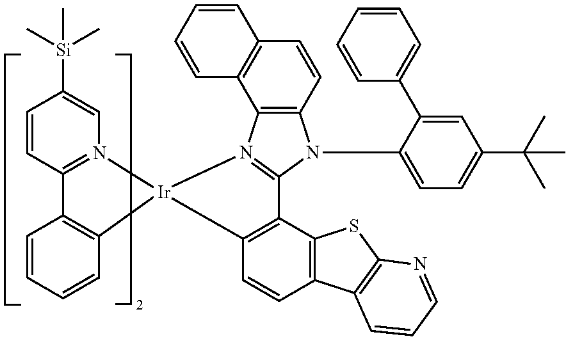
3915
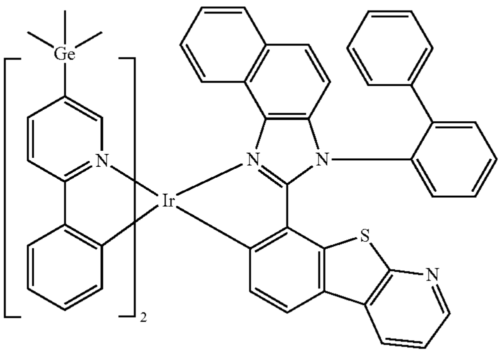
3916
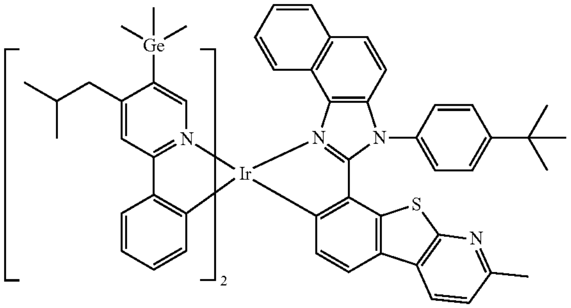
-continued
3917
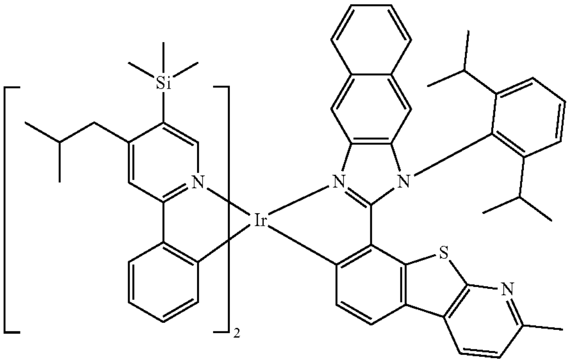
3918
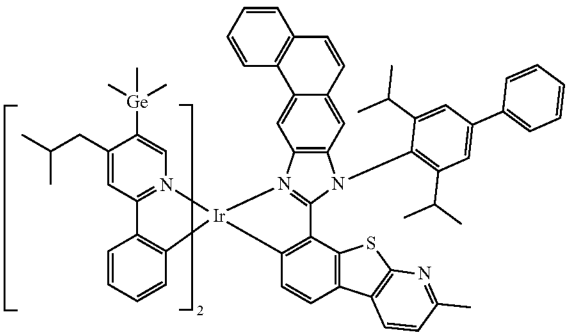
3919
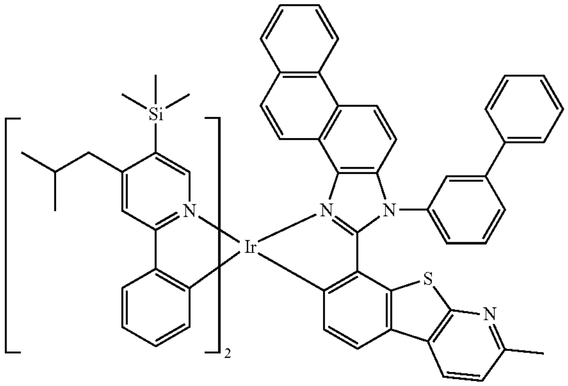
3920
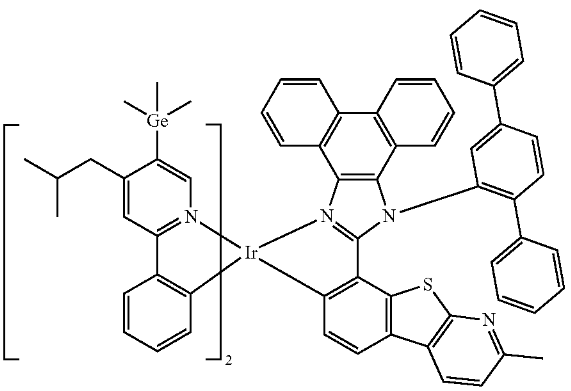

-continued
3921
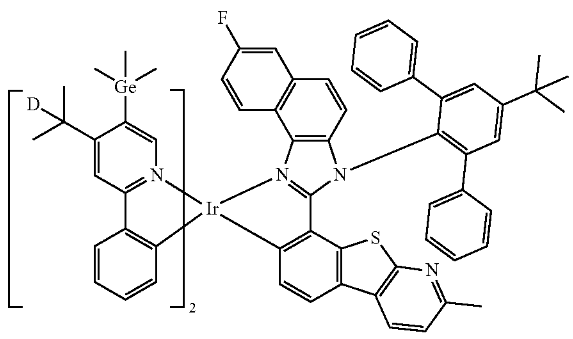
3922
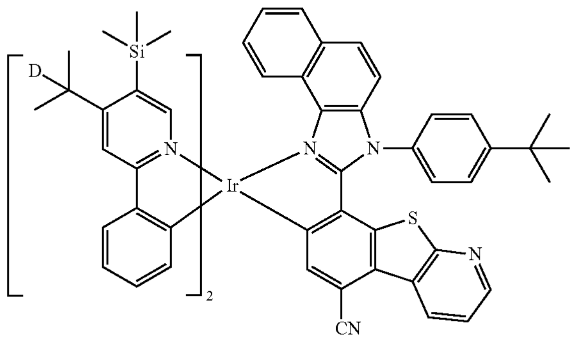
3923
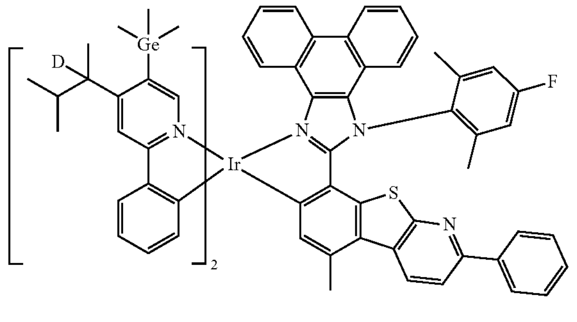
3924
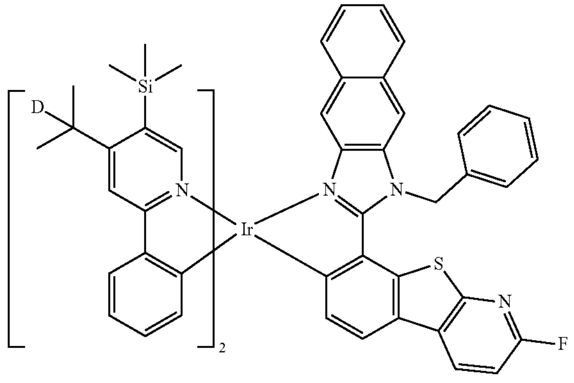
-continued
3925
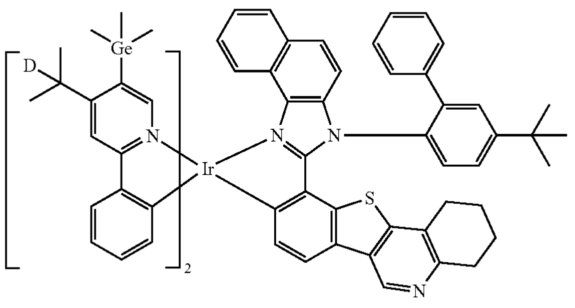
3926
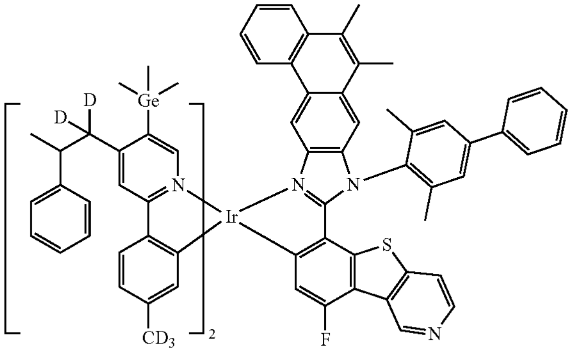
3927
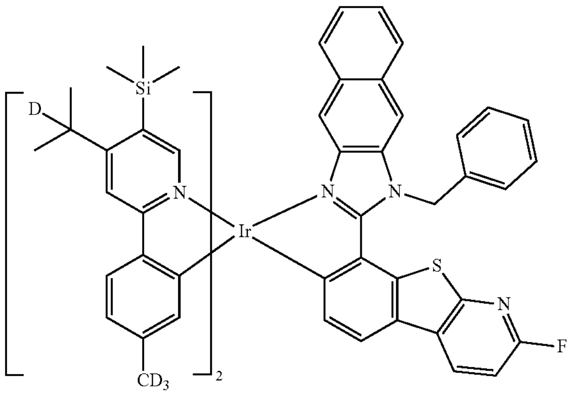
3928
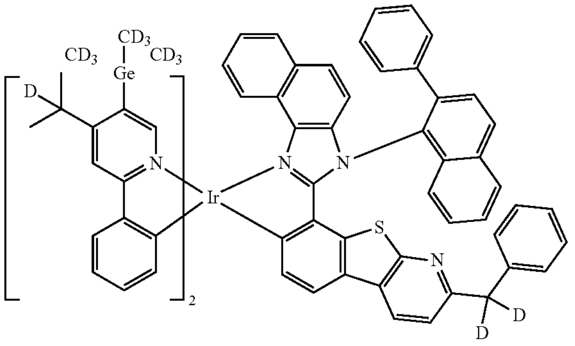

3929
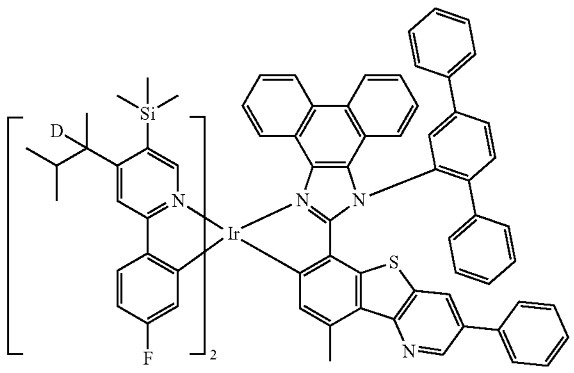
3930
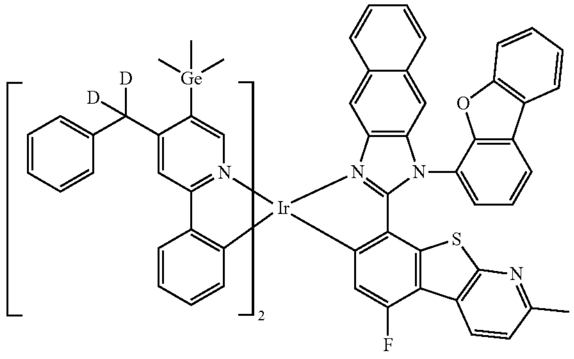
3931
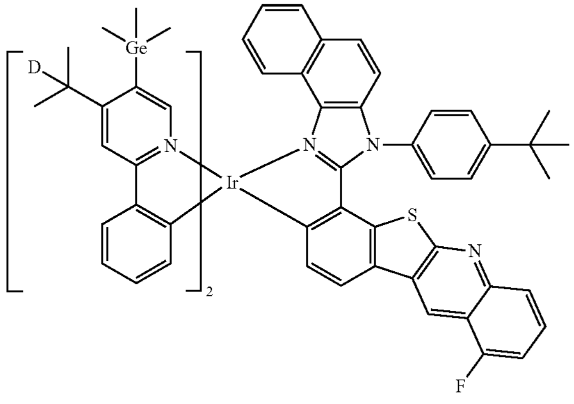
3932
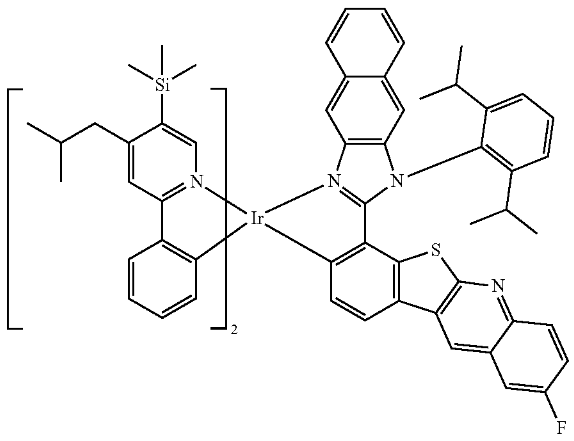
3933
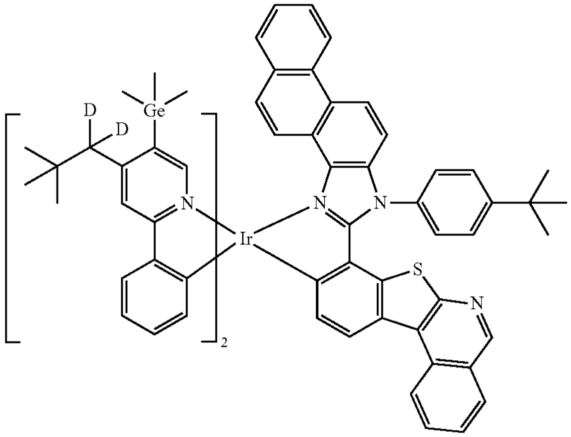
3934
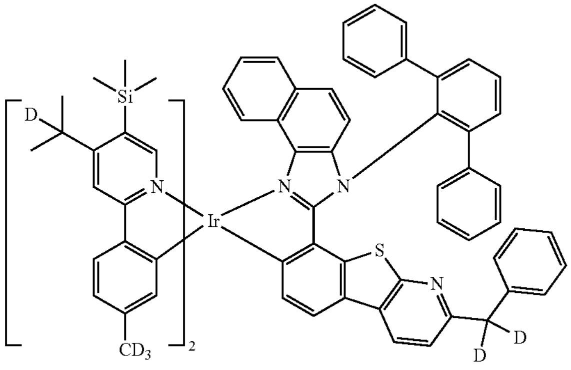
3935
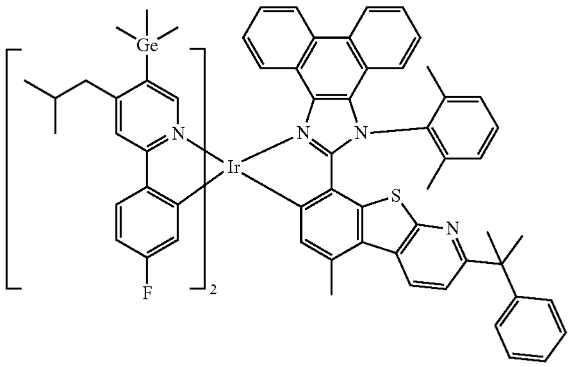
3936
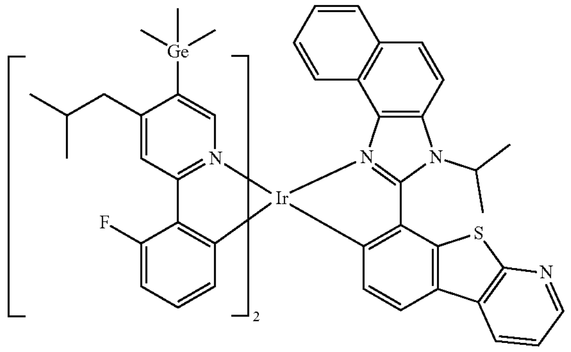

-continued
3937
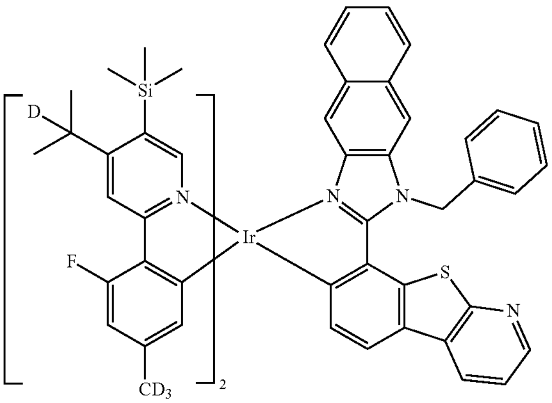
3938
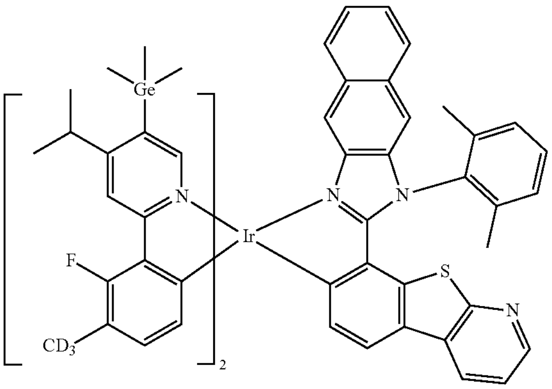
3939
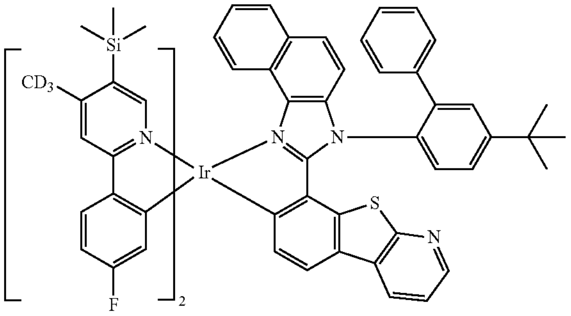
3940
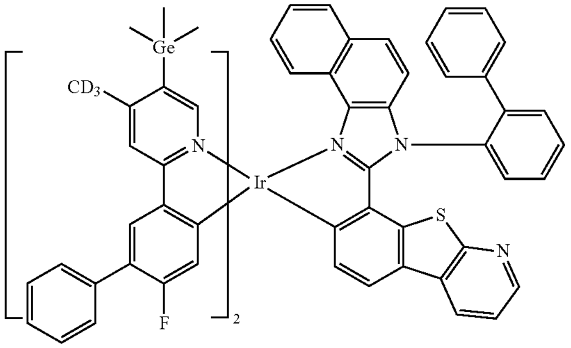
-continued
3941
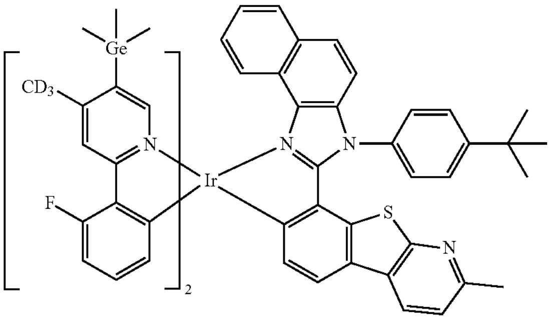
3942
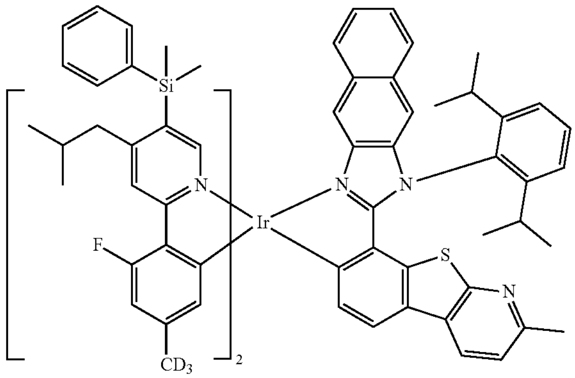
3943
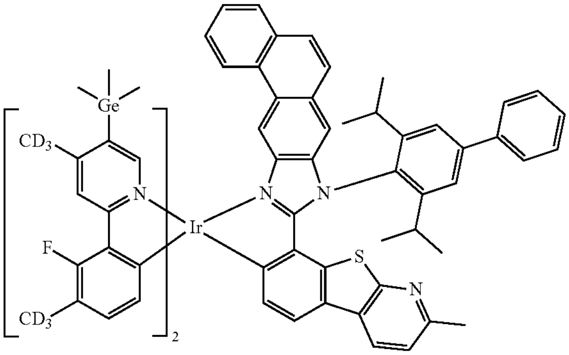
3944
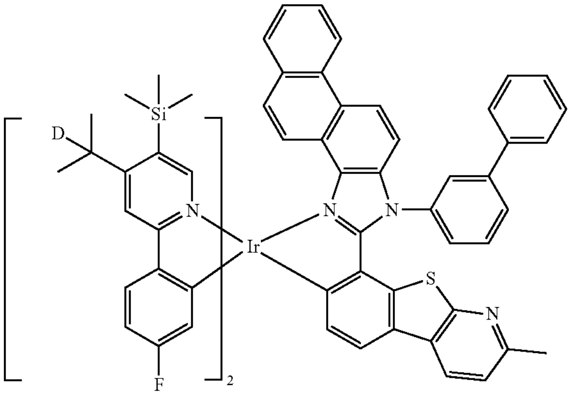

3945
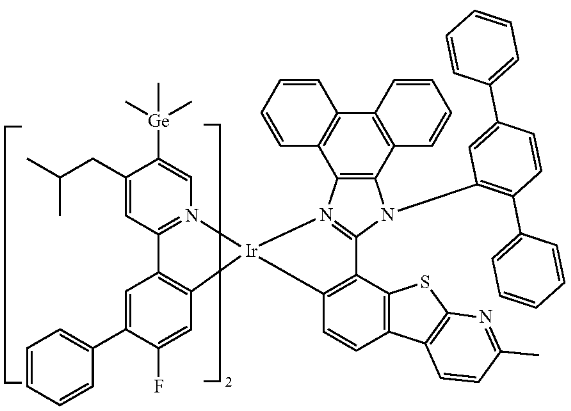
3946
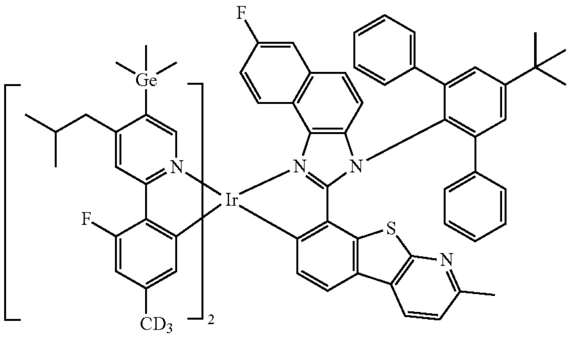
3947
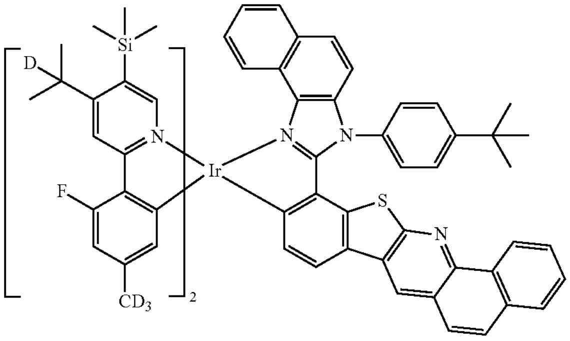
3948
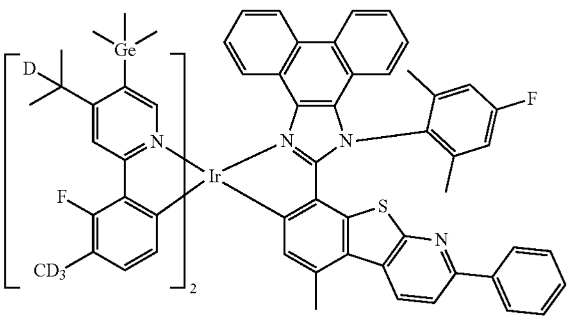
3949
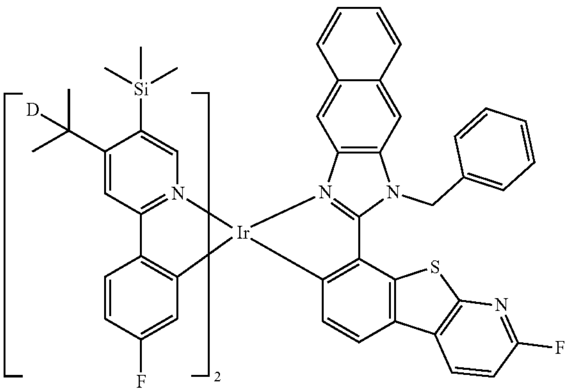
3950
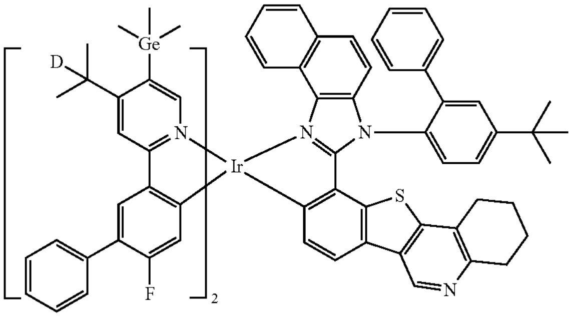
3951
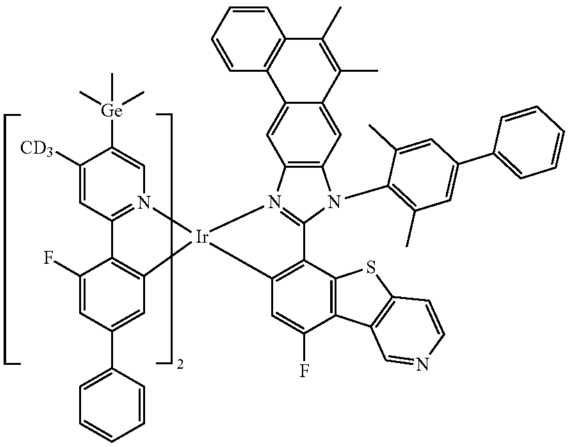
3952
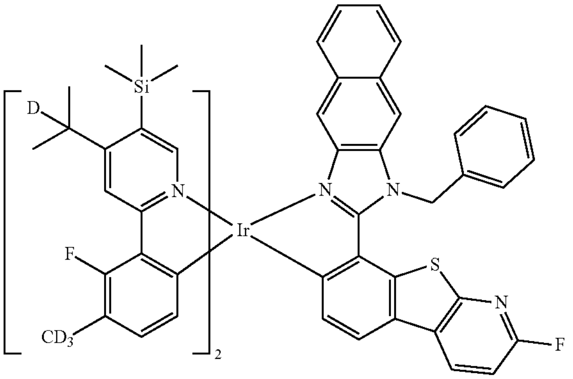

-continued
3953
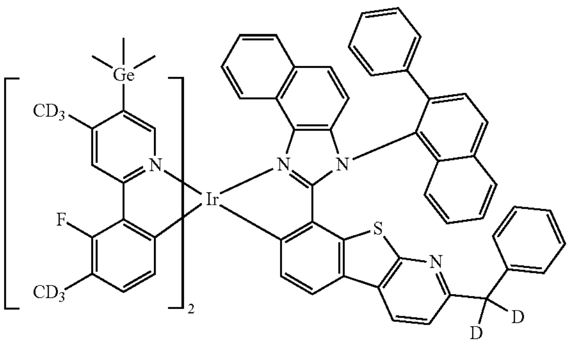
3954
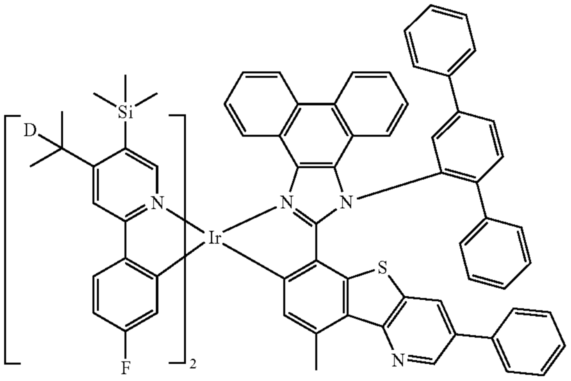
3955
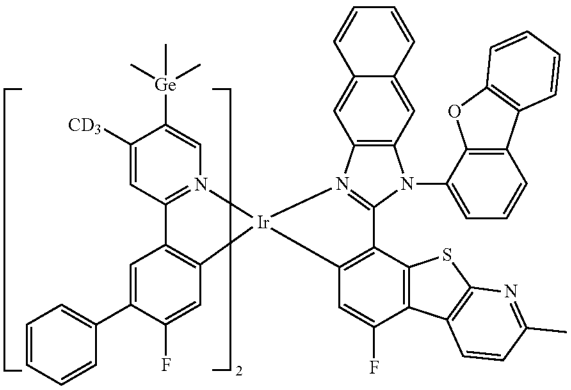
3956
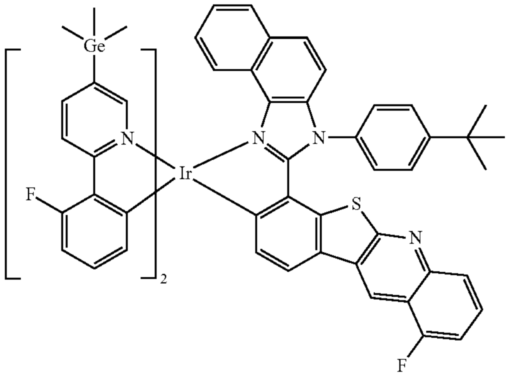
-continued
3957
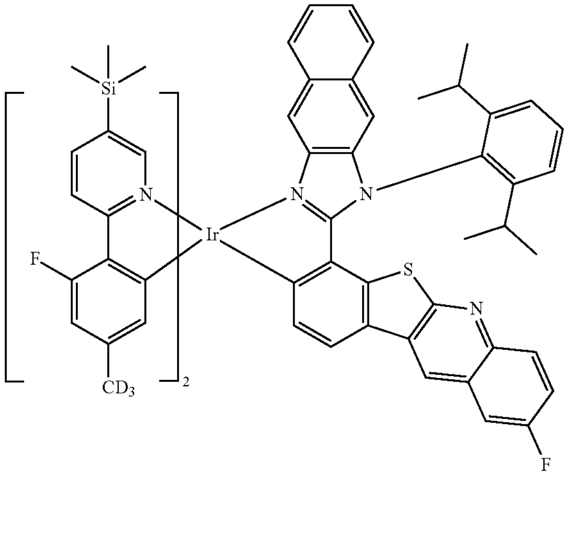
3958
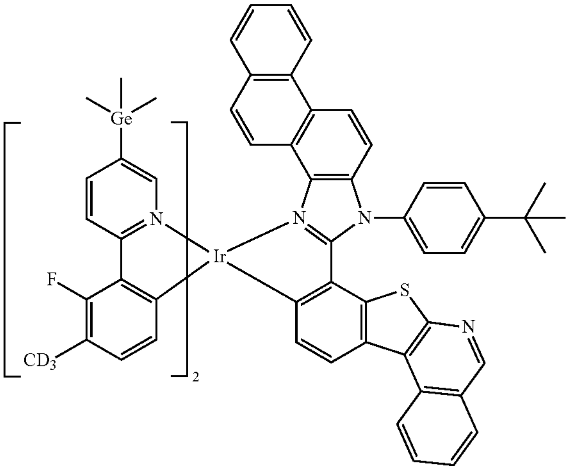
3959
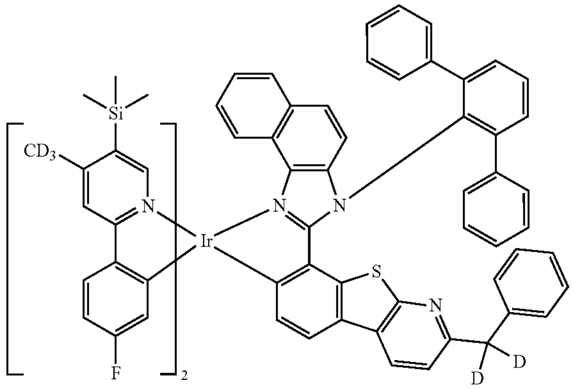

-continued
3960
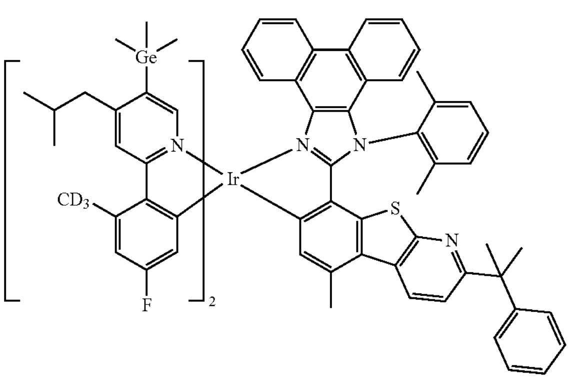
3961
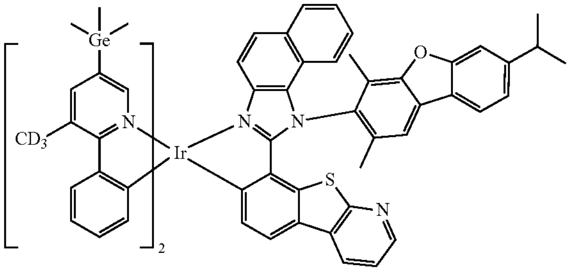
3962
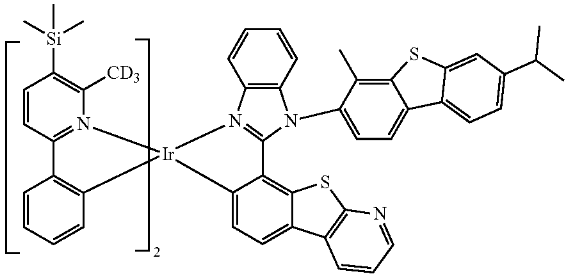
3963
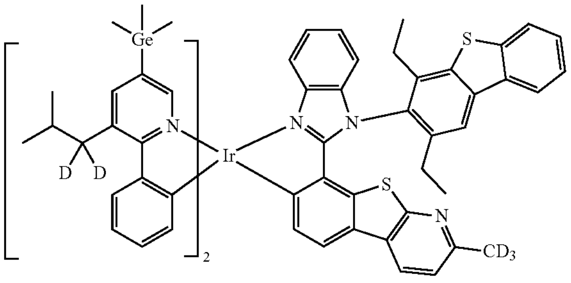
3964
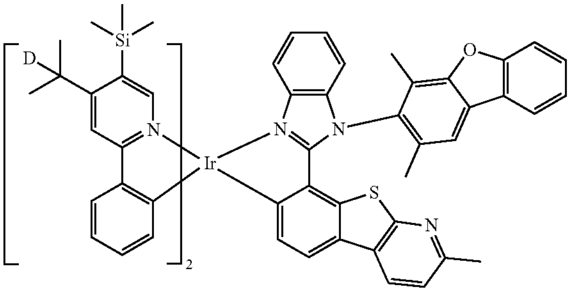
-continued
3965
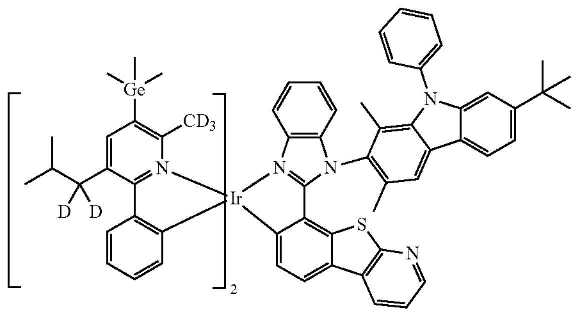
3966
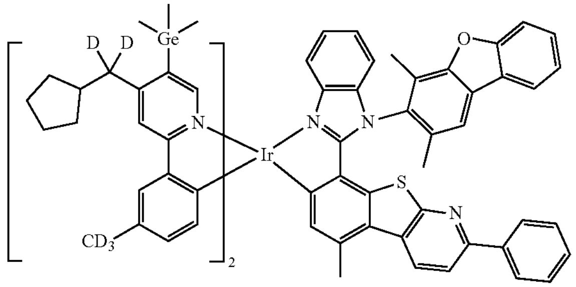
3967
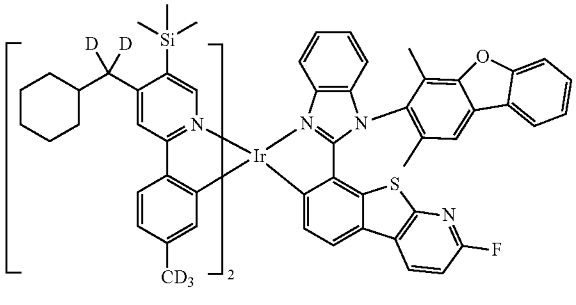
3968
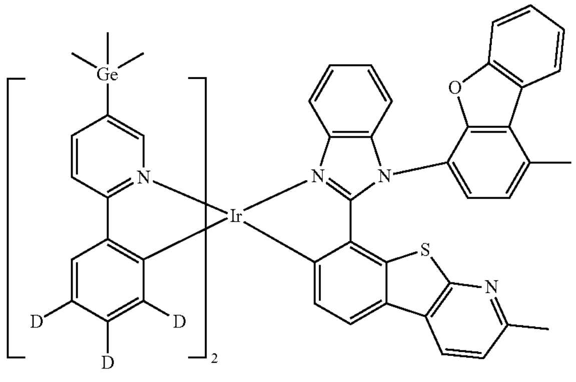

-continued
3969
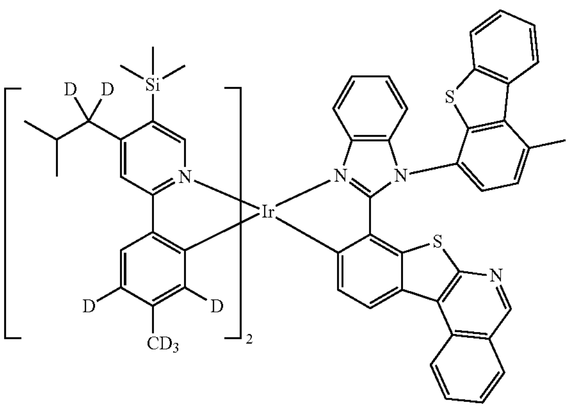
3970
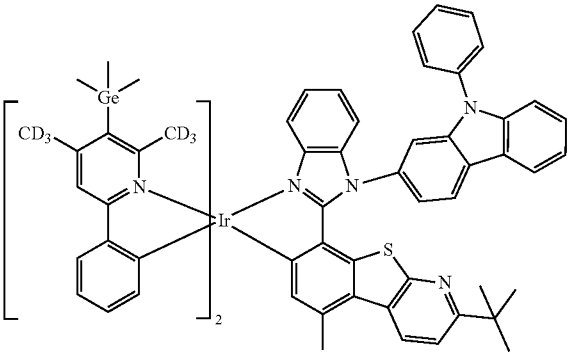
3971
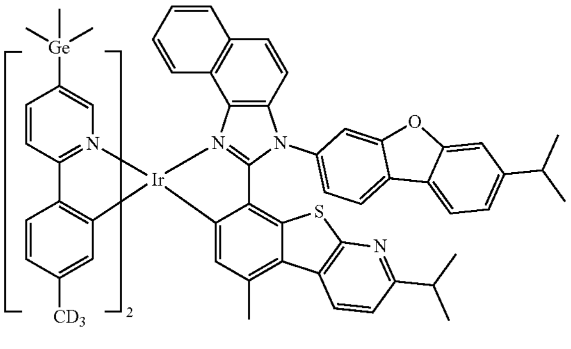
3972
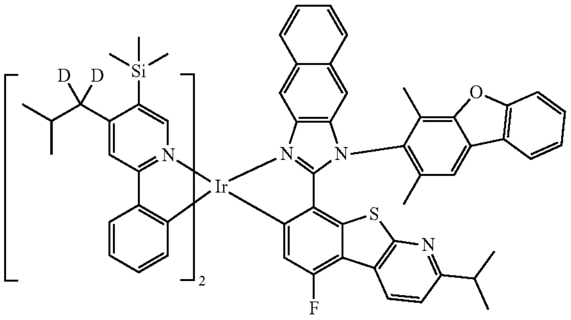
-continued
3973
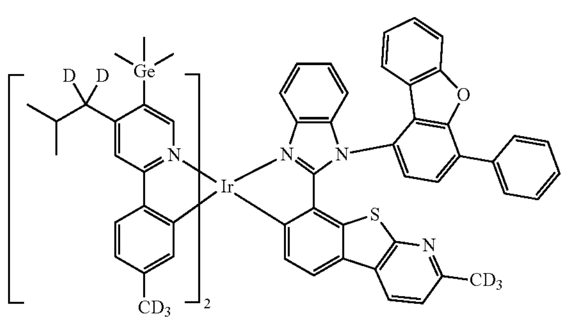
3974
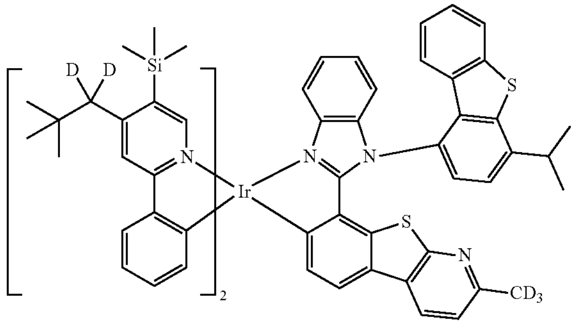
3975
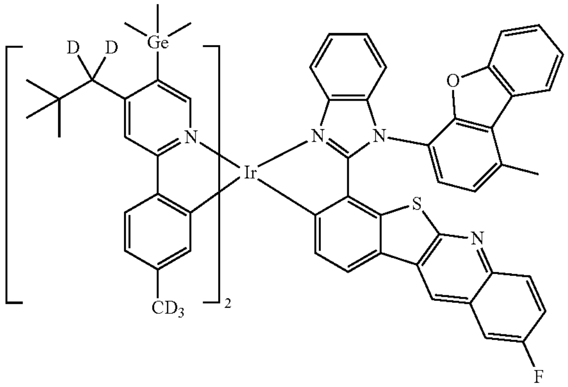
3976
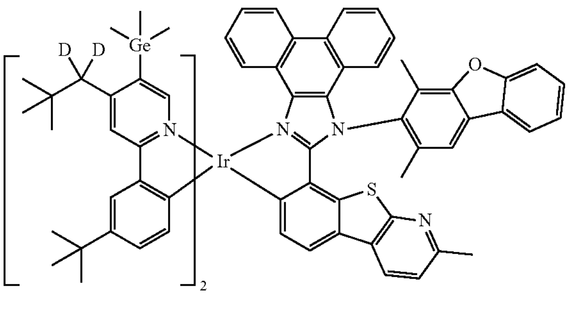

-continued
3977
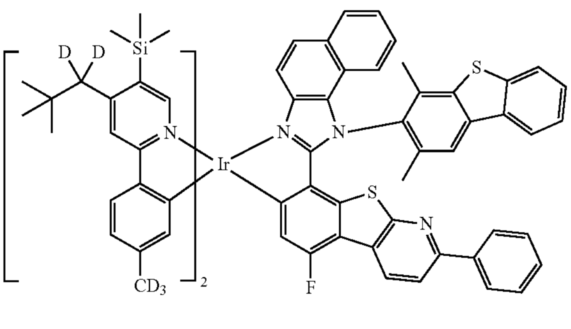
3978
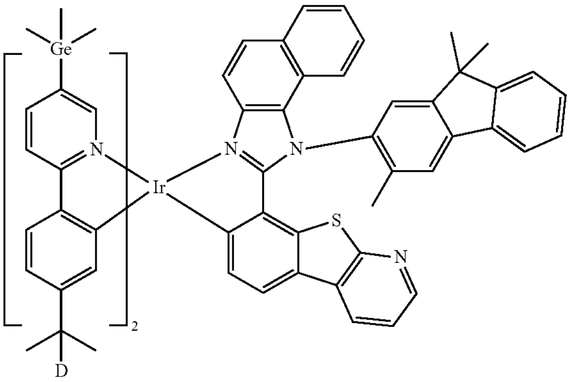
3979
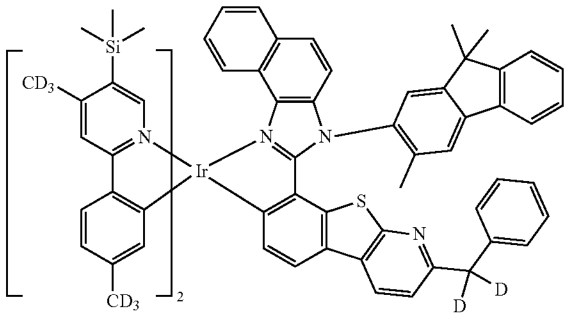
3980
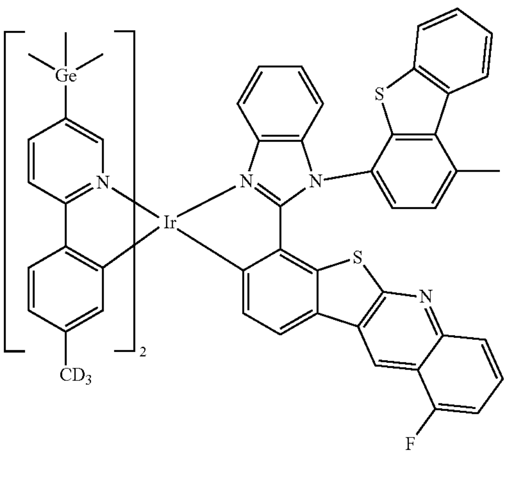
-continued
3981
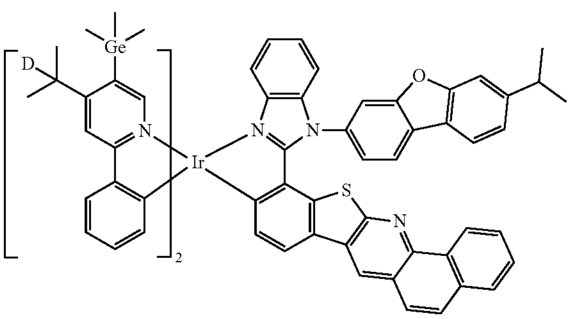
3982
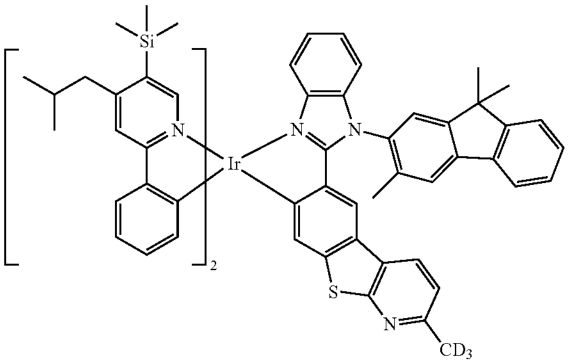
3983
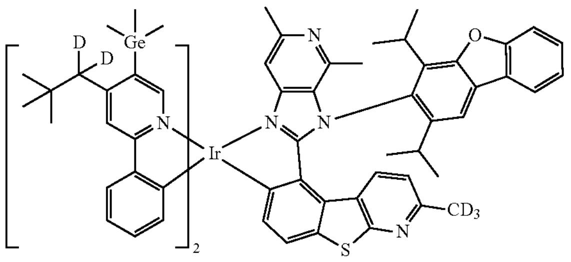
3984
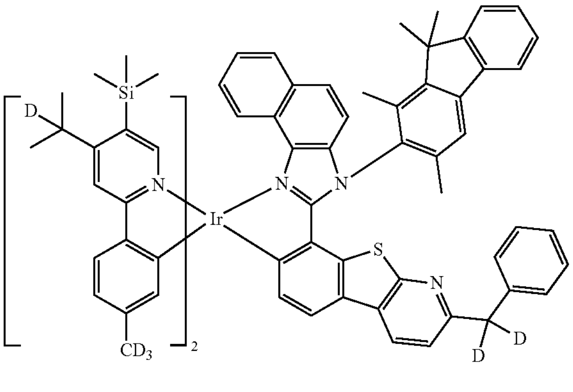

-continued
3985
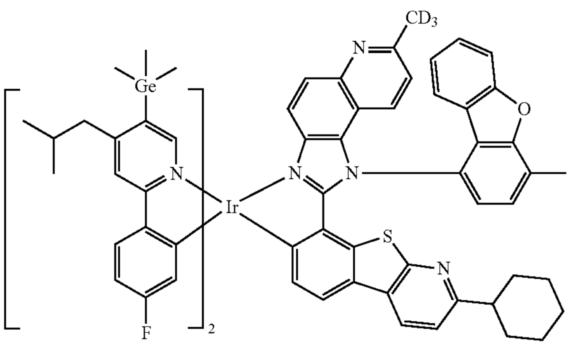
3986
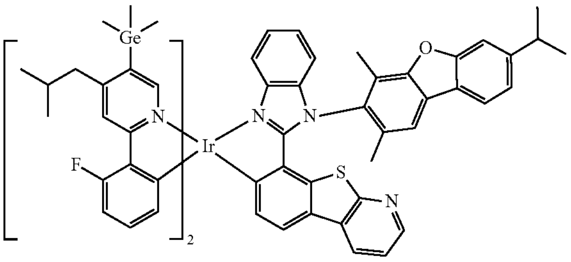
3987
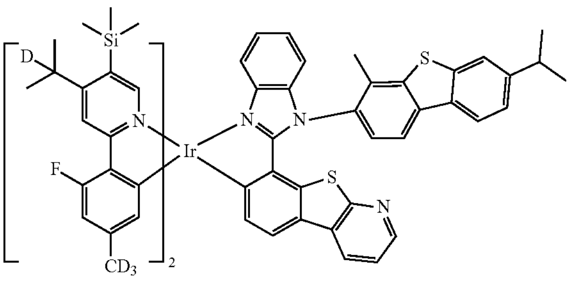
3988
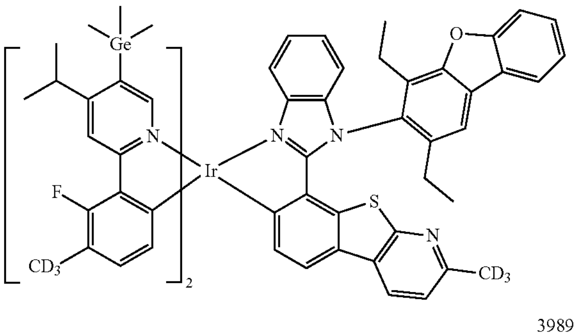
3989
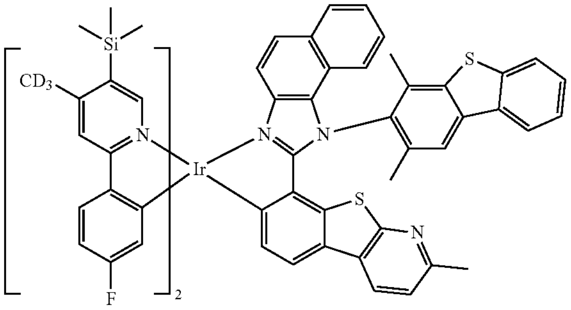
-continued
3990
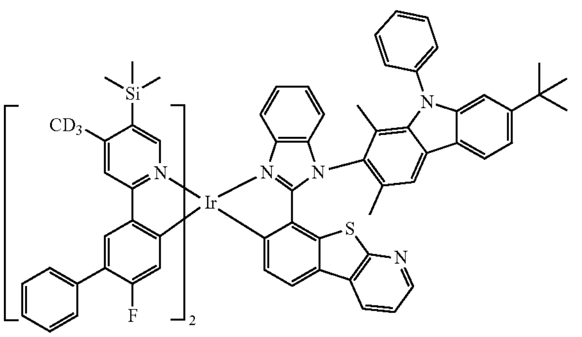
3991
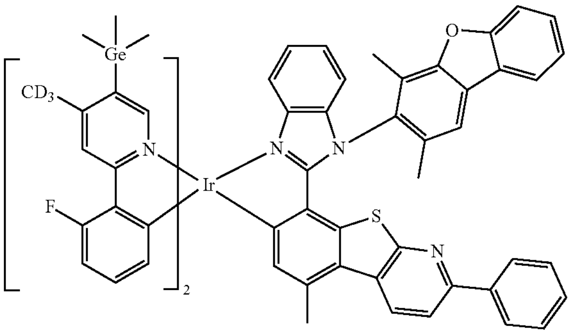
3992
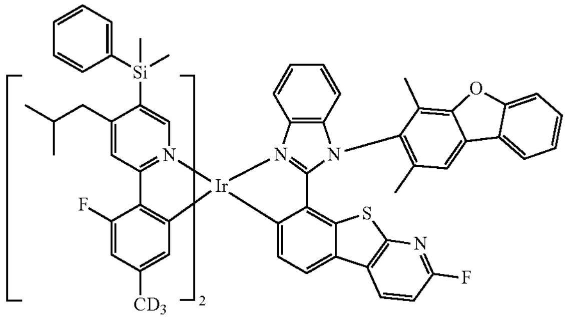
3993
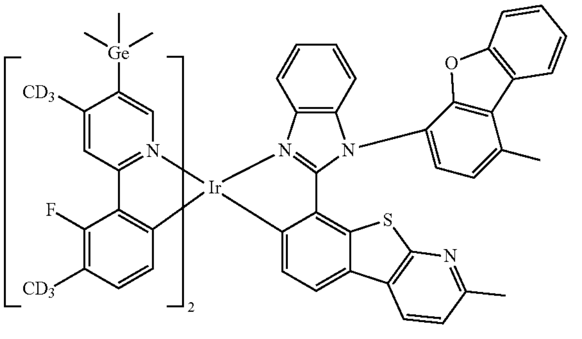

-continued
3994
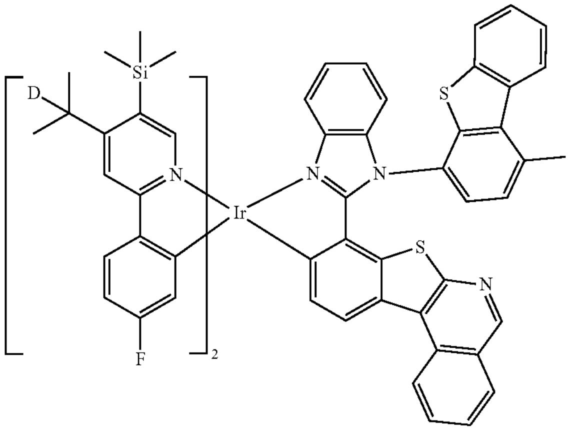
3995
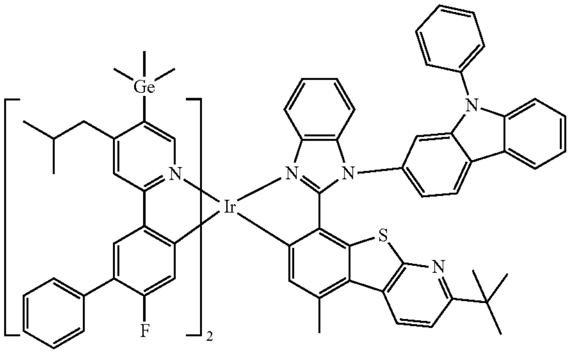
3996
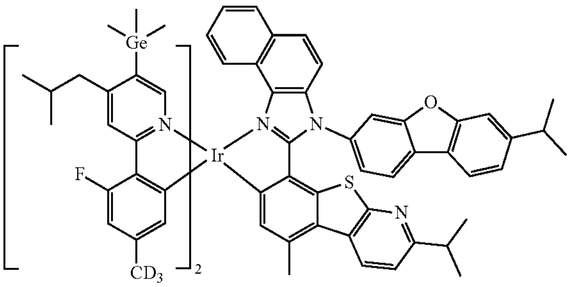
3997
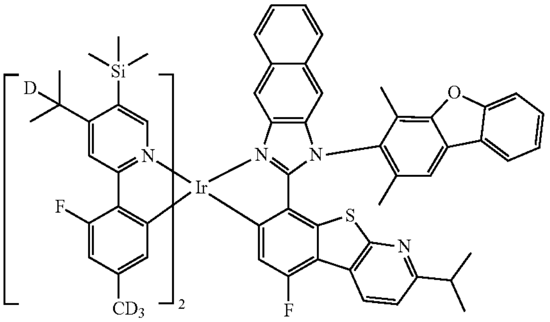
-continued
3998
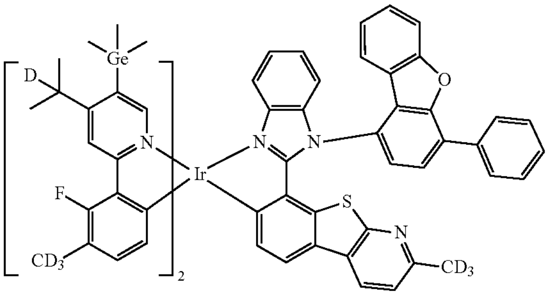
3999
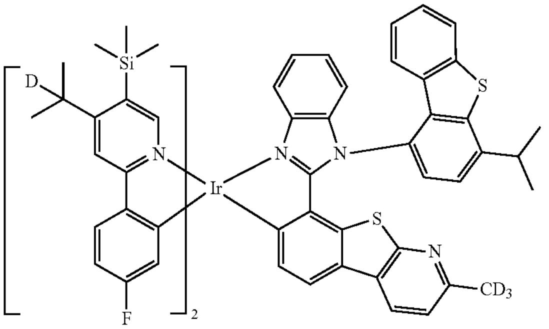
4000
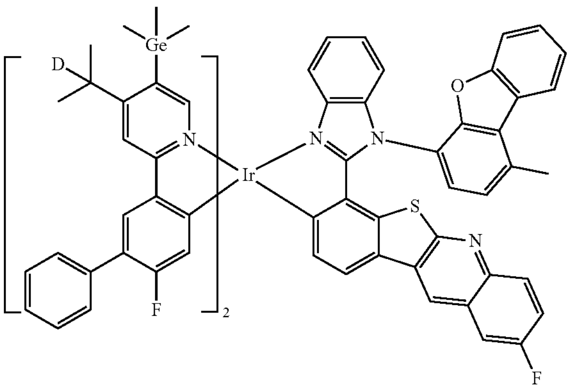
4001
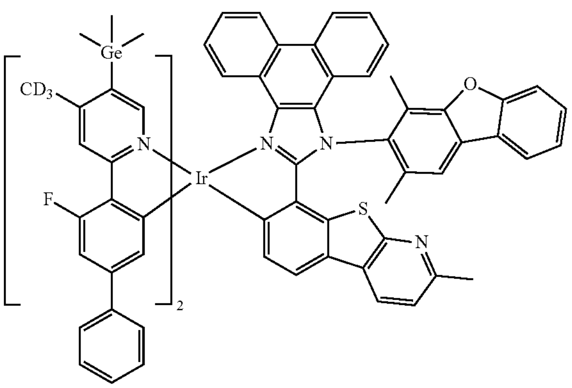

-continued
4002
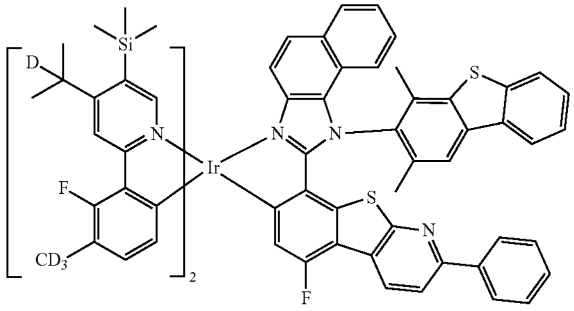
4003
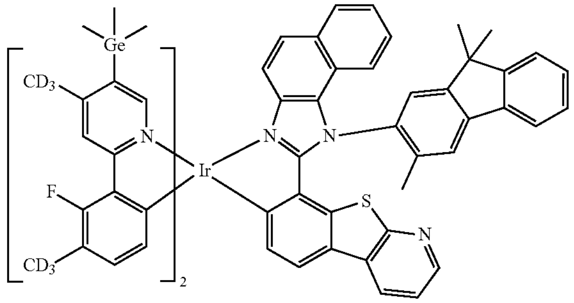
4004
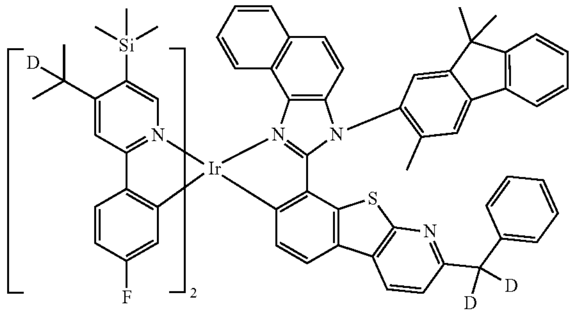
4005
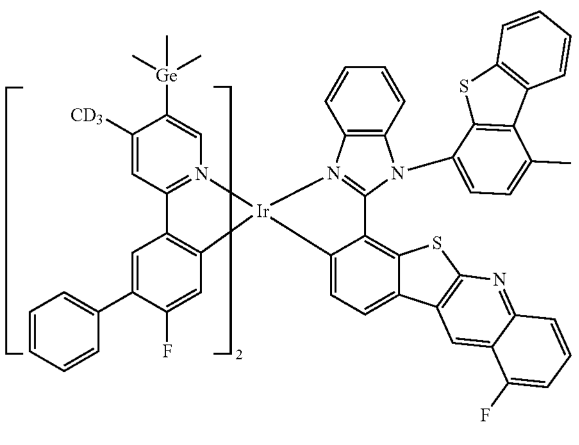
4006
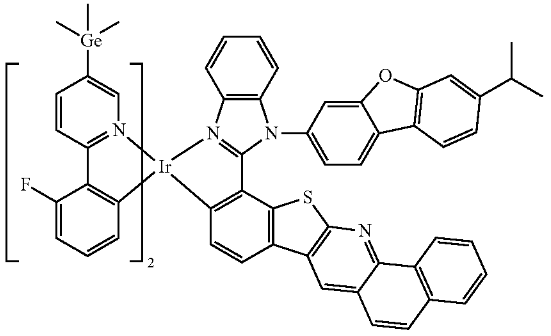
4007
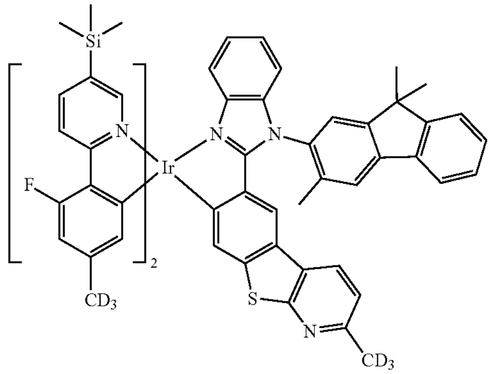
4008
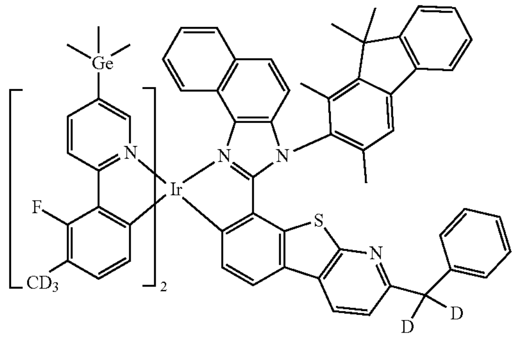
4009
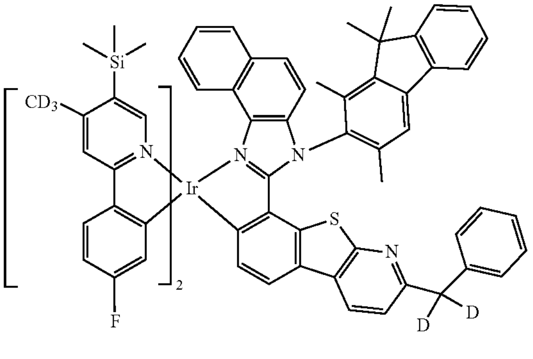

4010
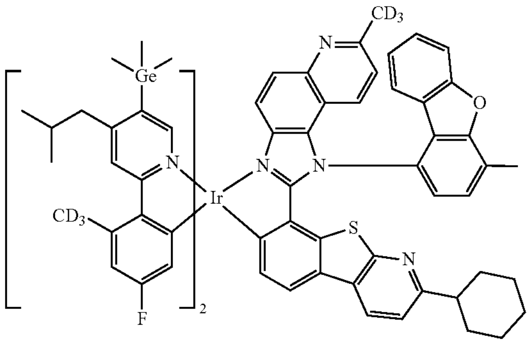
In one or more embodiments, the first hole-transporting compound and the second hole-transporting compound may each independently be at least one of Compounds H1-1 to H1-72 of [Group 5-1], Compounds H1-1 to H1-20 of [Group 5-2], or a combination thereof:
Group 5-1
H1-1
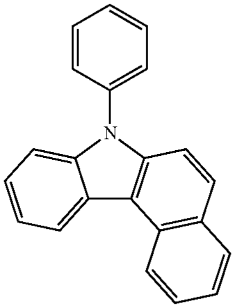
H1-2
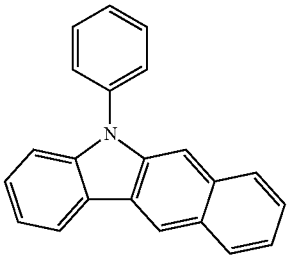
H1-3
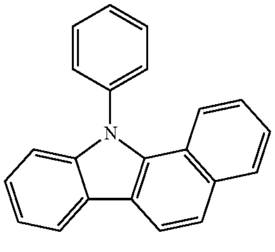
H1-4
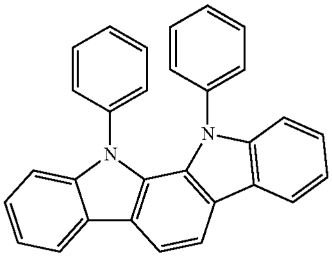
H1-5
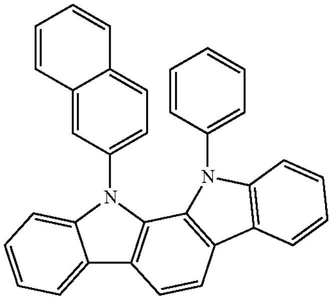
H1-6
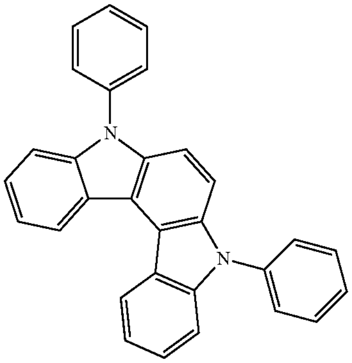
H1-7
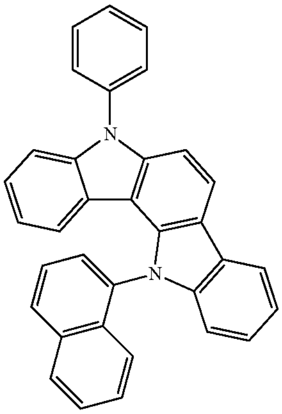

-continued
H1-8
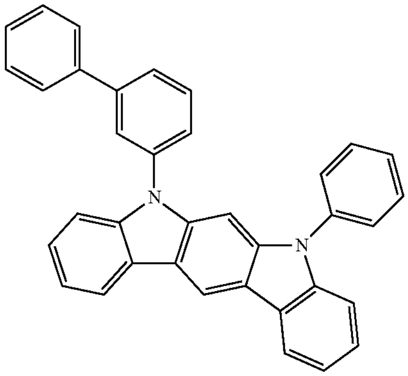
H1-9
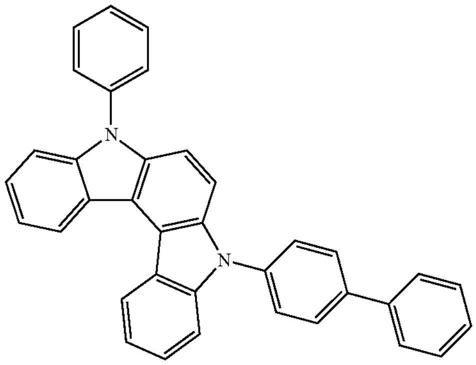
H1-10
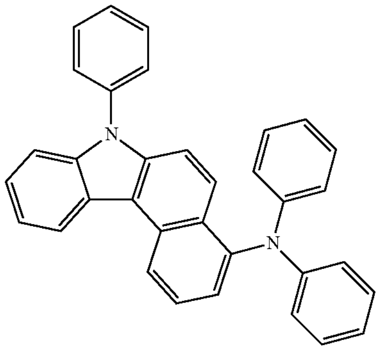
H1-11
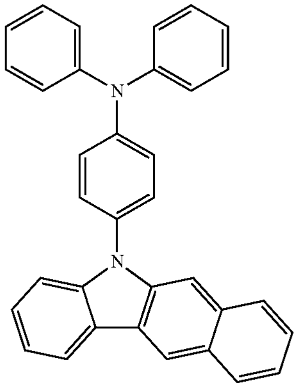
-continued
H1-12
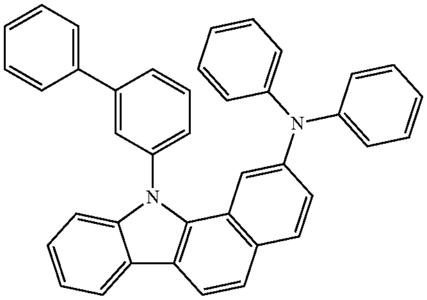
H1-13
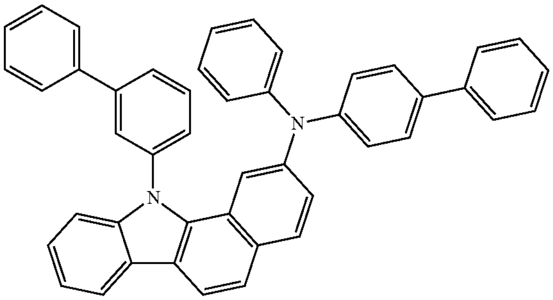
H1-14
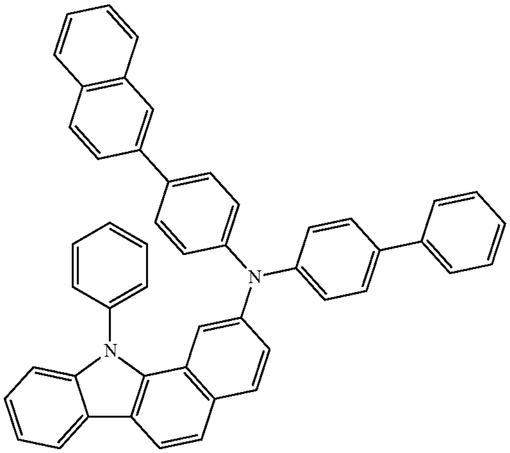
H1-15
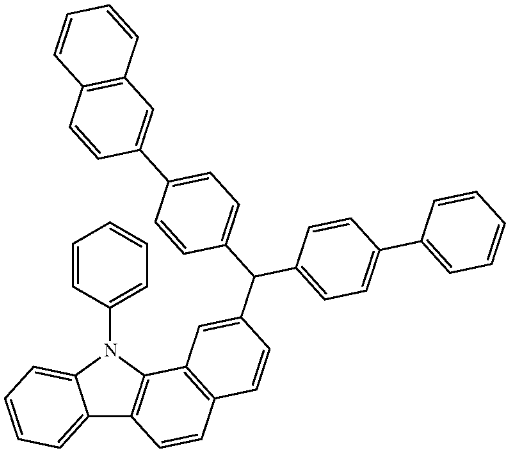

-continued
H1-16
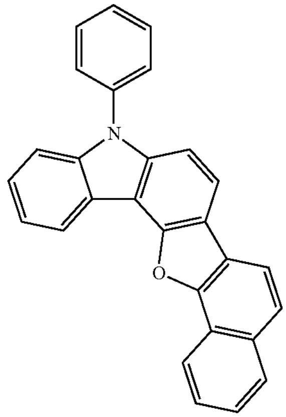
H1-17
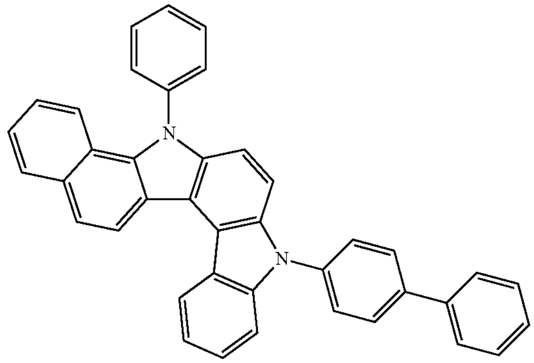
H1-18
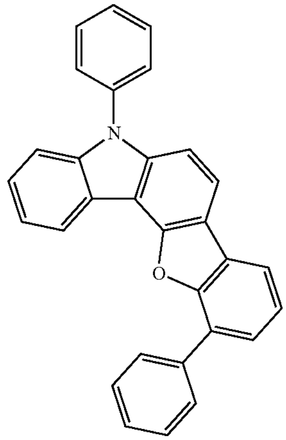
H1-19
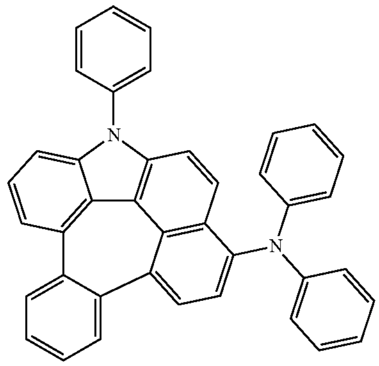
-continued
H1-20
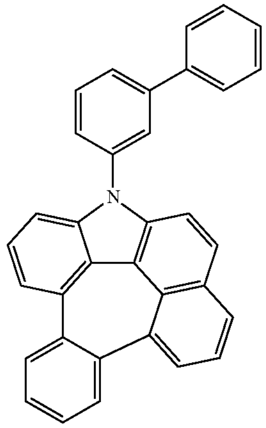
H1-21
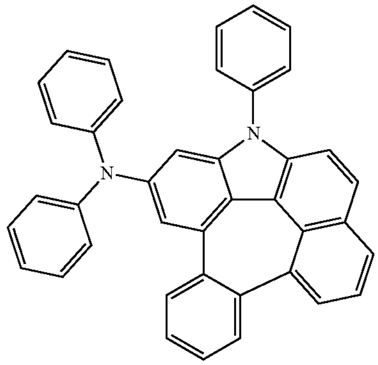
H1-22
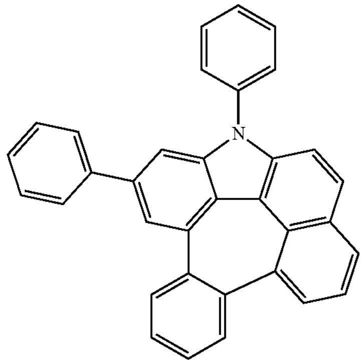
H1-23
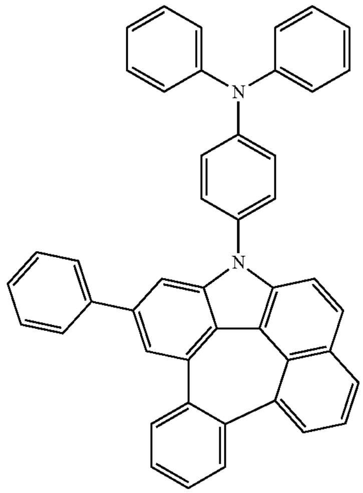

-continued
H1-24
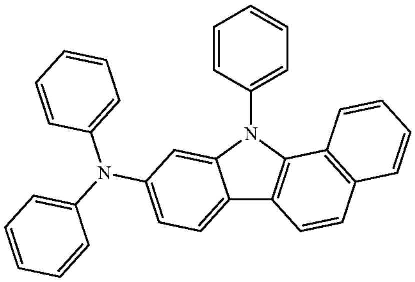
H1-25
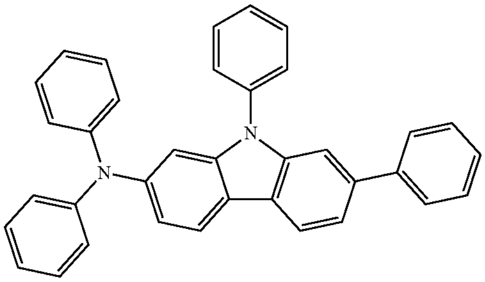
H1-26
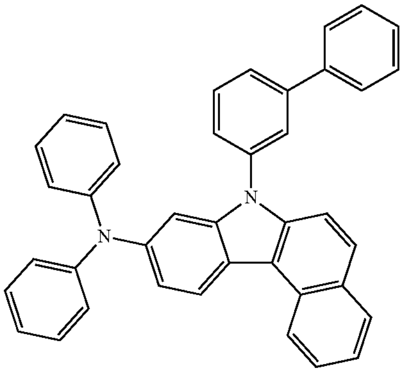
H1-27
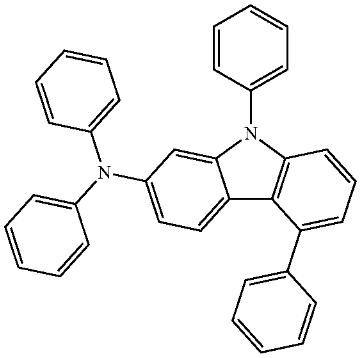
-continued
H1-28
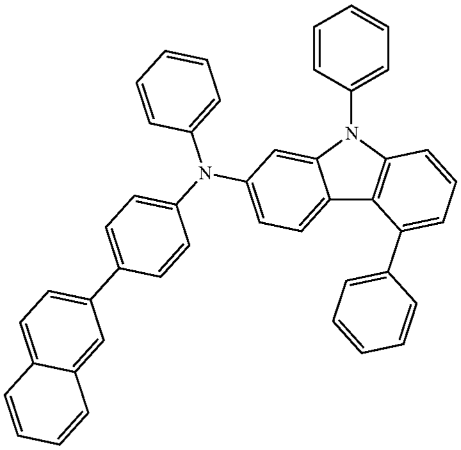
H1-29
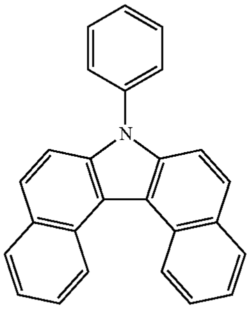
H1-30
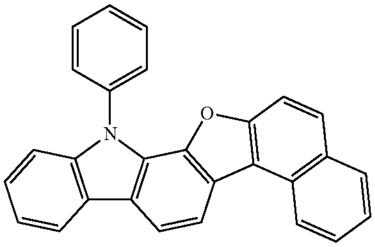
H1-31
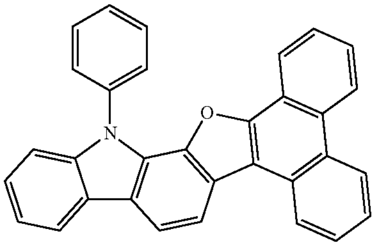

-continued
H1-32
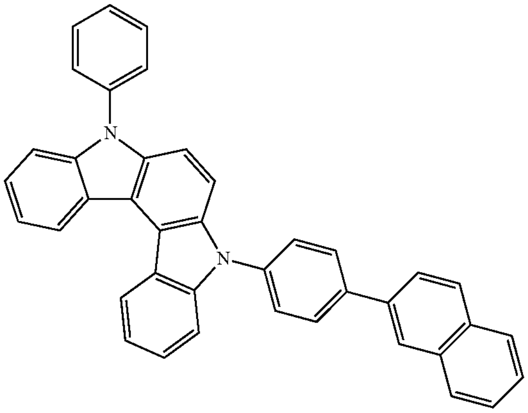
H1-33
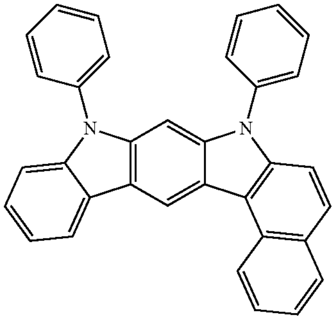
H1-34
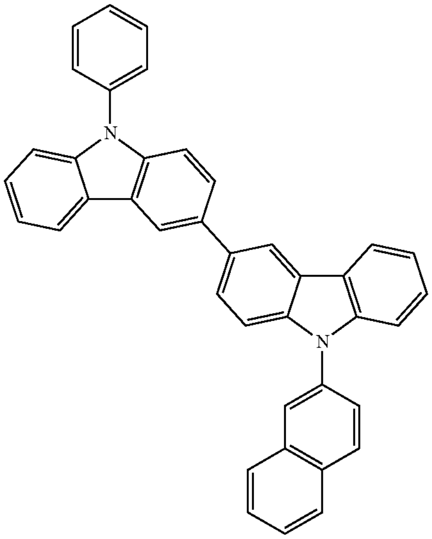
-continued
H1-35
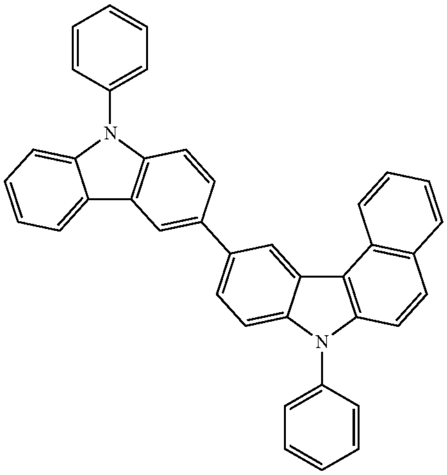
H1-36
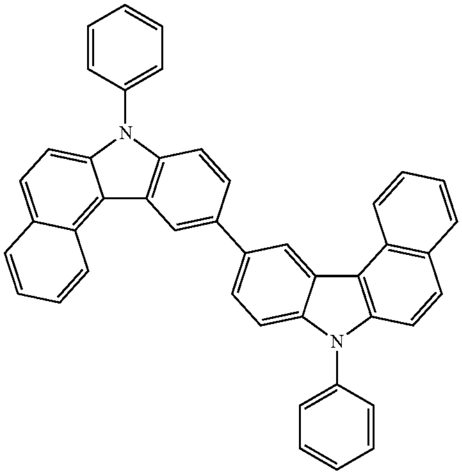
H1-37
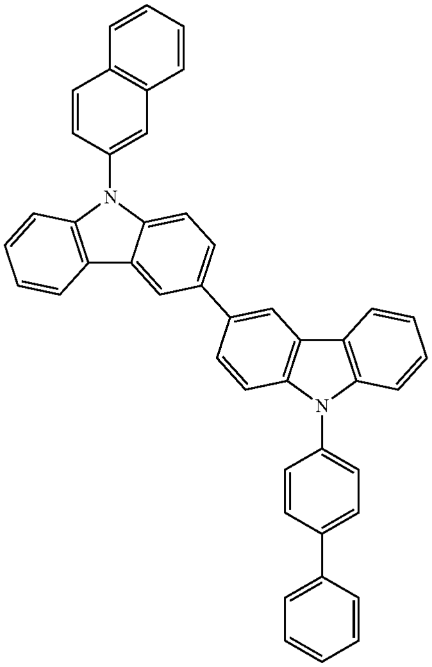

-continued
H1-38
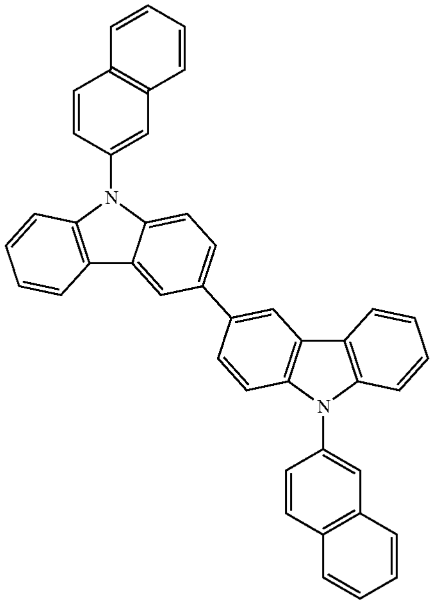
H1-39
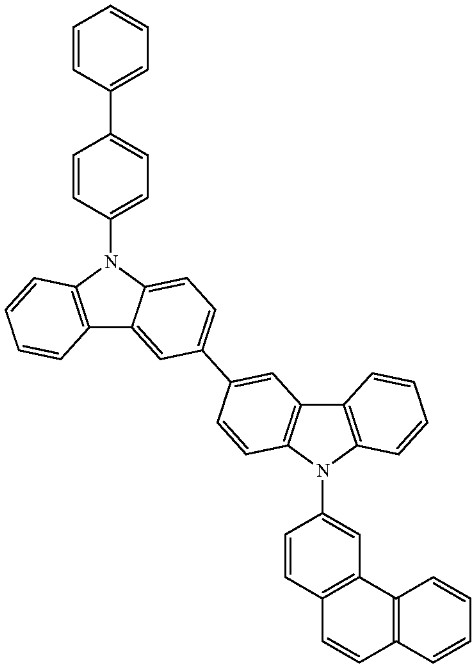
-continued
H1-40
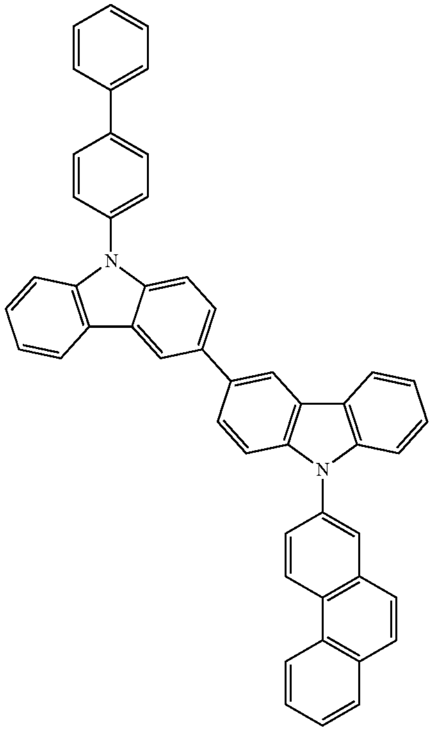
H1-41
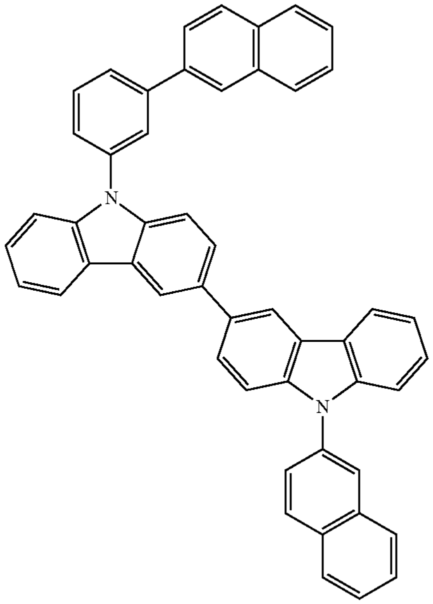

-continued
H1-42
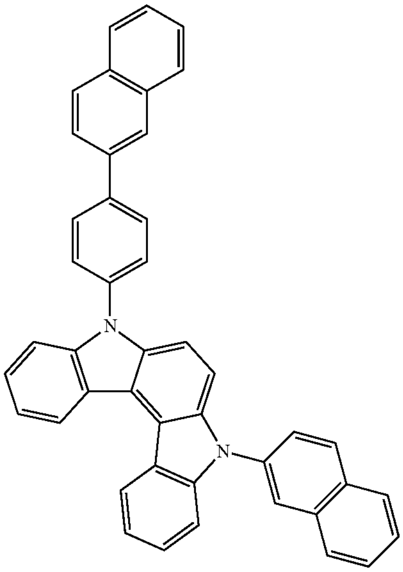
H1-43
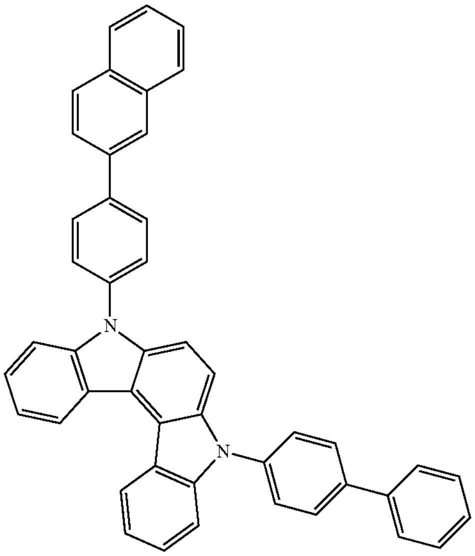
H1-44
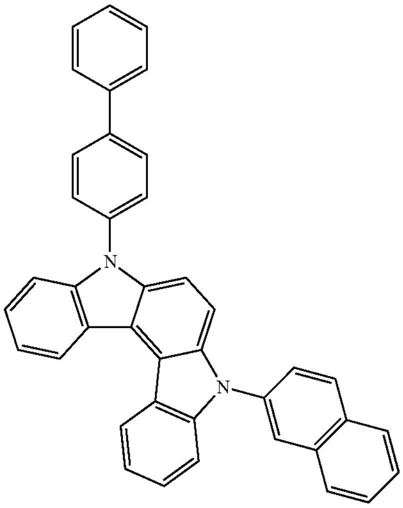
-continued
H1-45
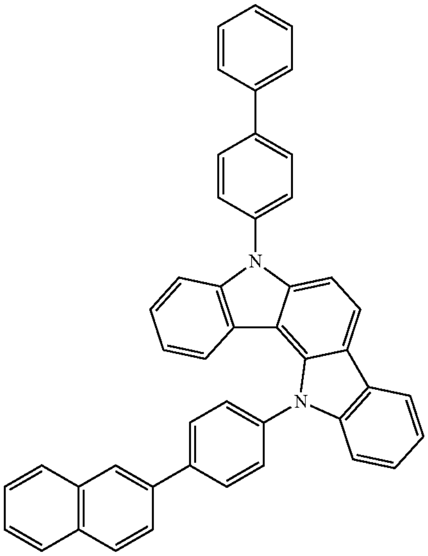
H1-46
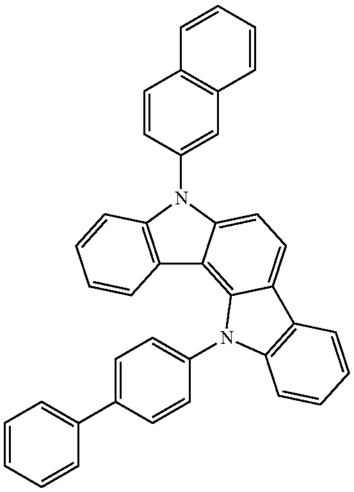
H1-47
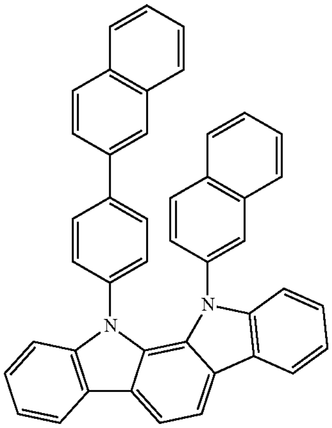

-continued
H1-48
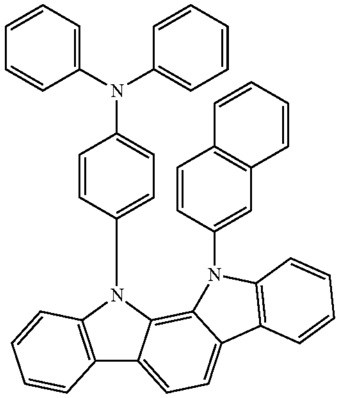
H1-49
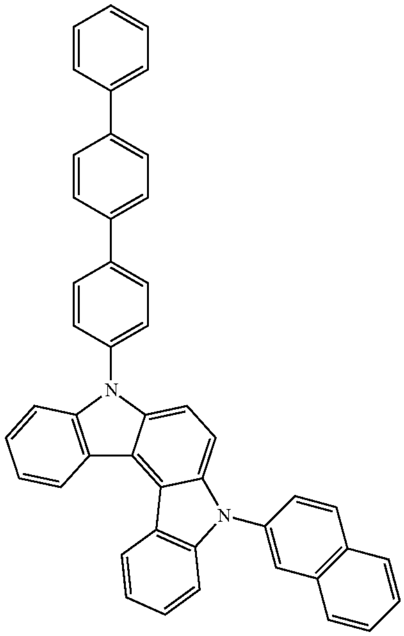
H1-50
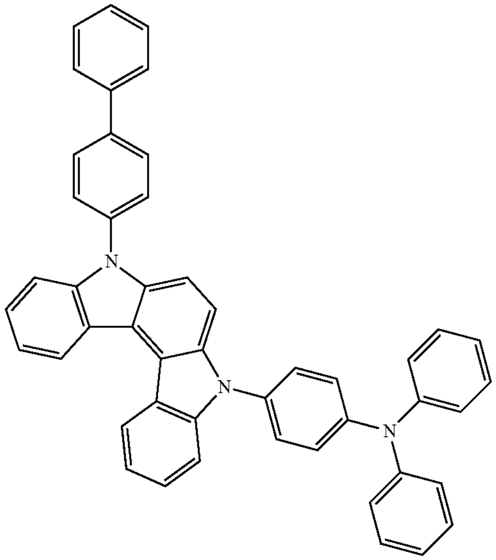
-continued
H1-51
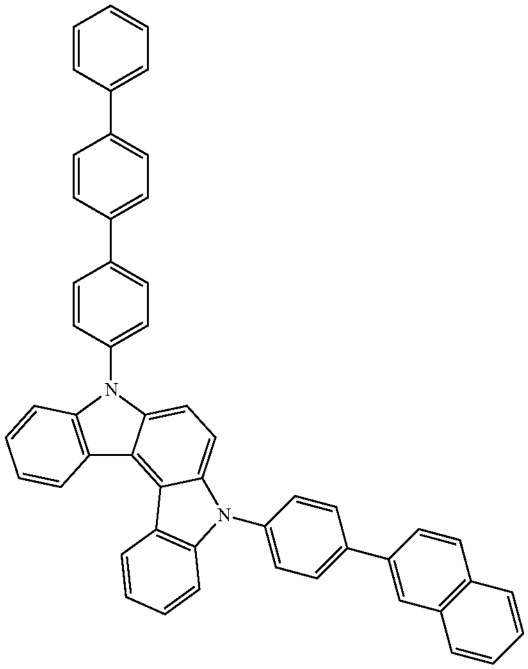
H1-52
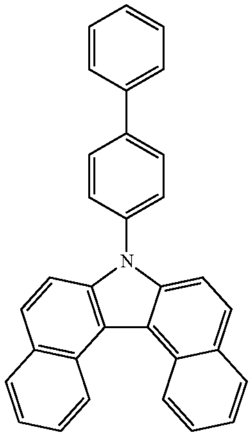
H1-53
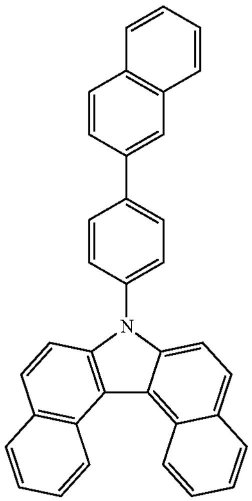

-continued
H1-54
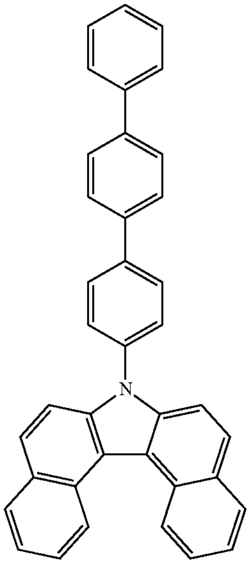
H1-55
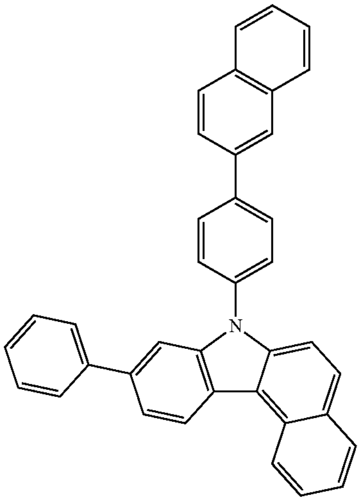
H1-56
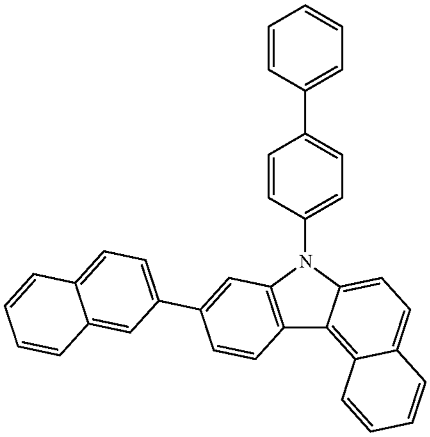
-continued
H1-57
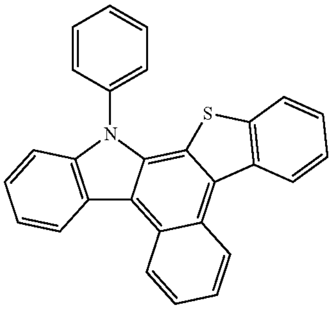
H1-58
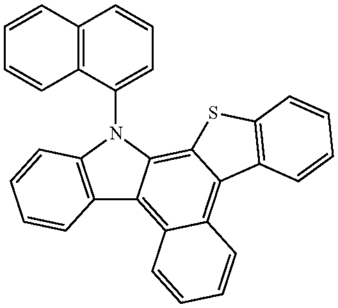
H1-59
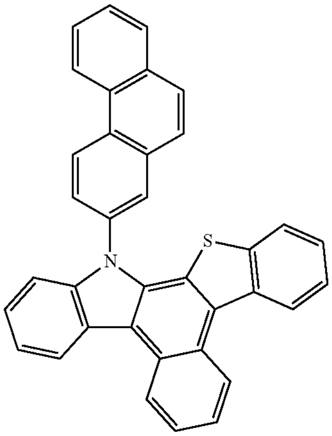
H1-60
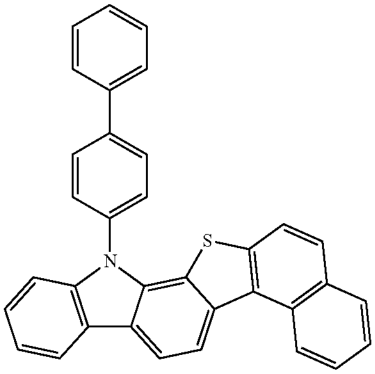

-continued
H1-61
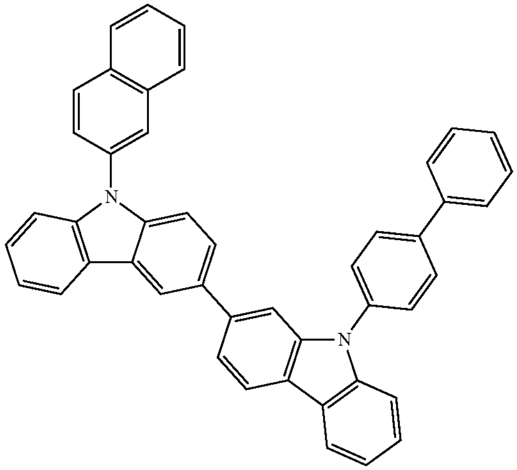
H1-62
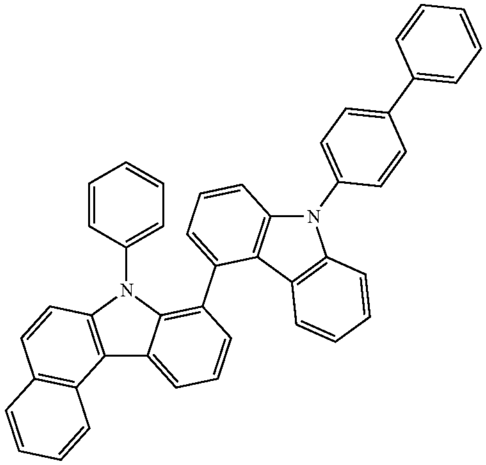
H1-63
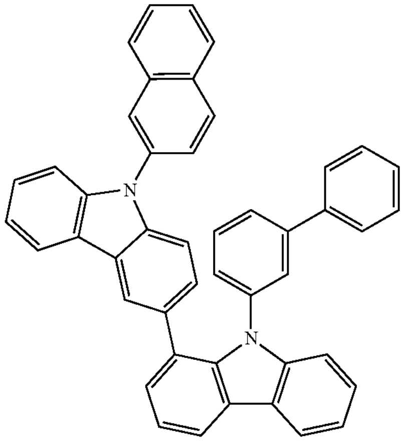
-continued
H1-64
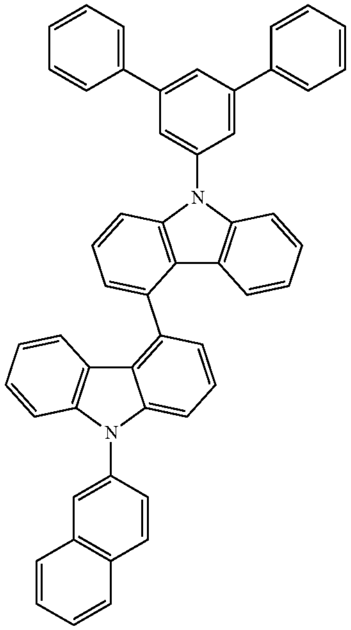
H1-65
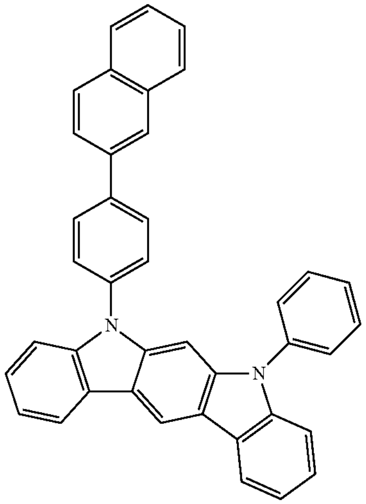
H1-66
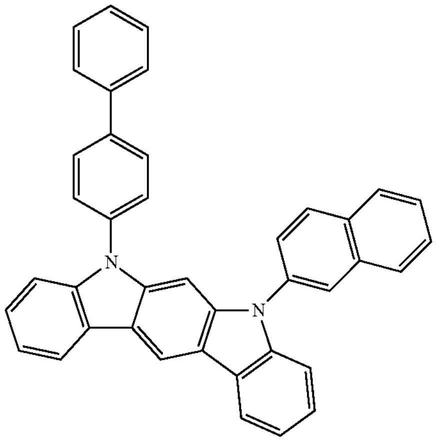

-continued
H1-67
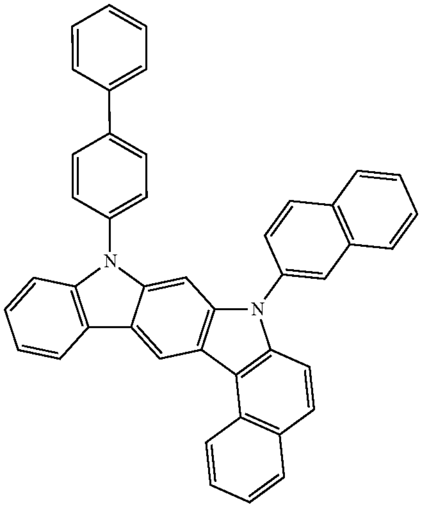
H1-68
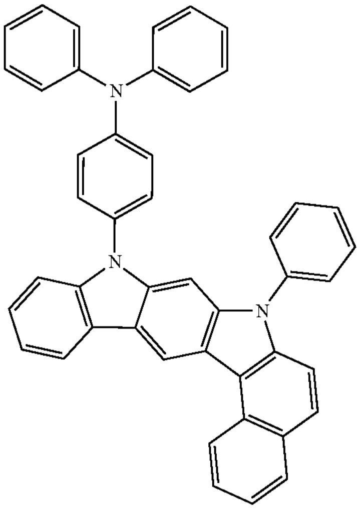
H1-69
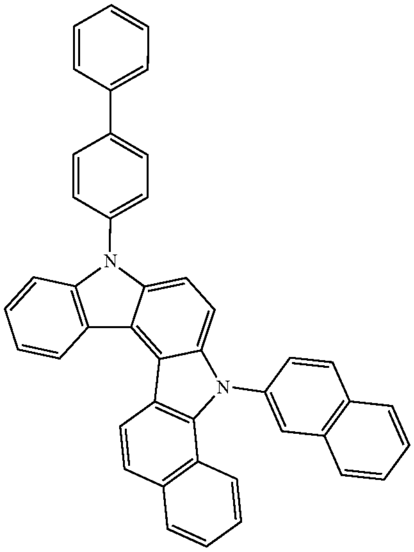
-continued
H1-70
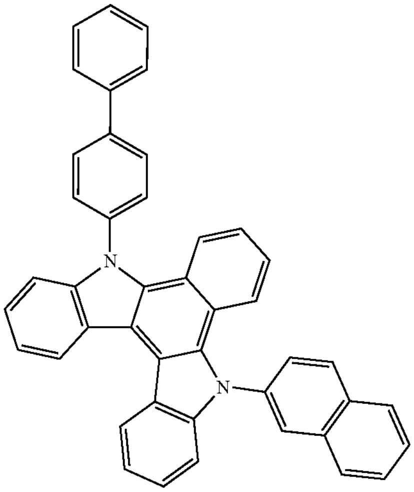
H1-71
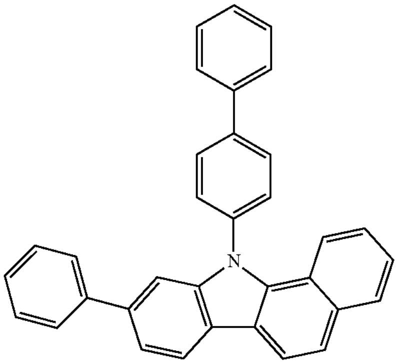
H1-72
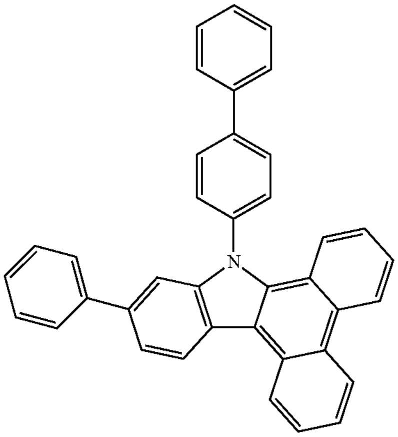

Group 5-2
H1-1
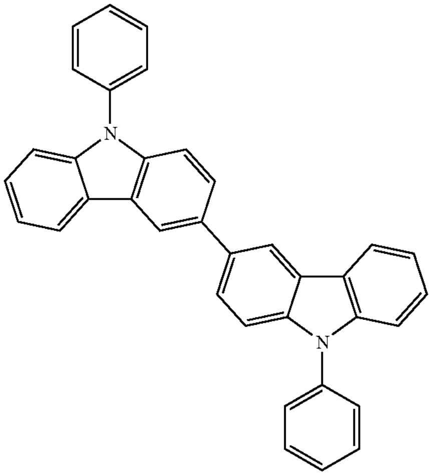
H1-2
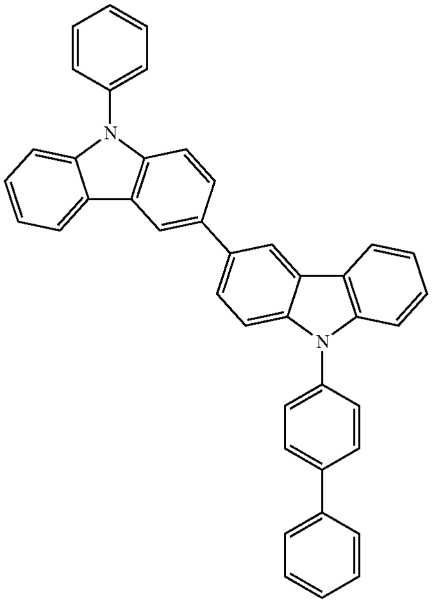
H1-3
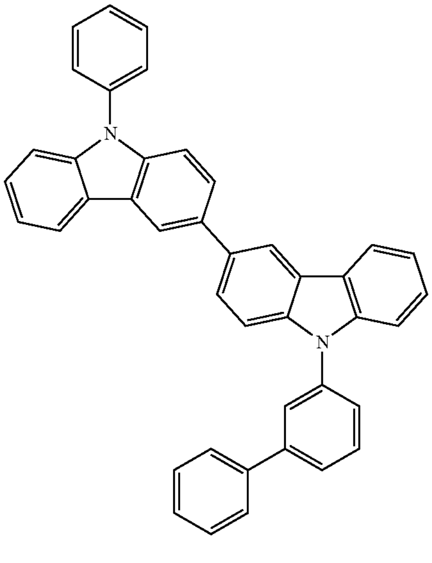
-continued
H1-4
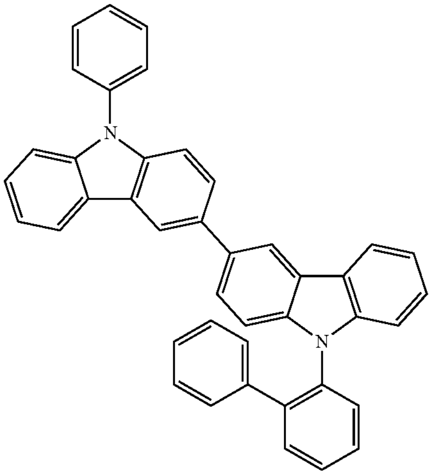
H1-5
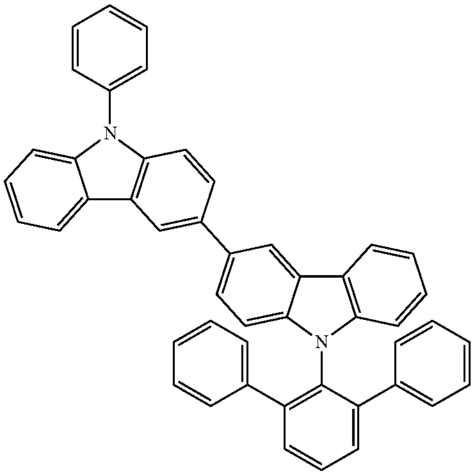
H1-6
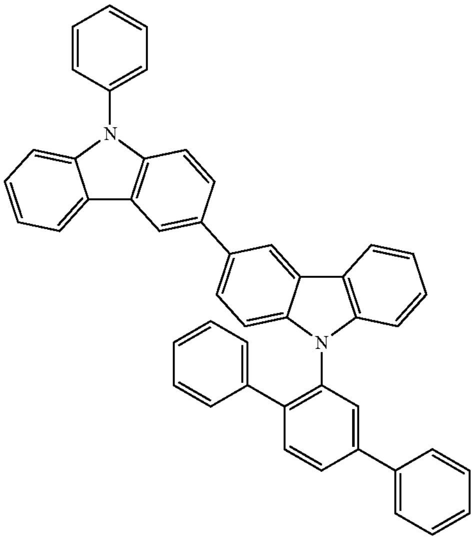

H1-7
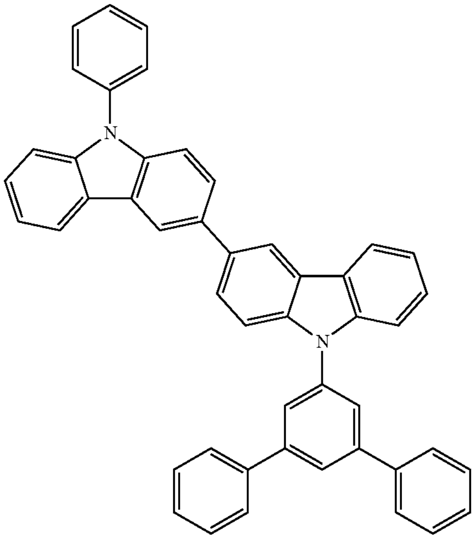
H1-8
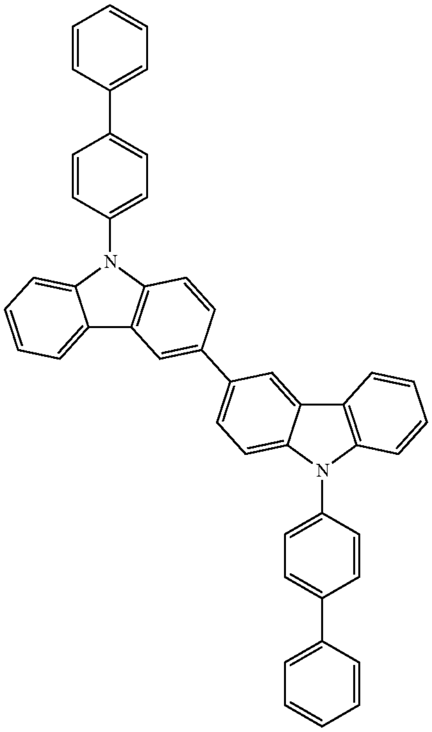
H1-9
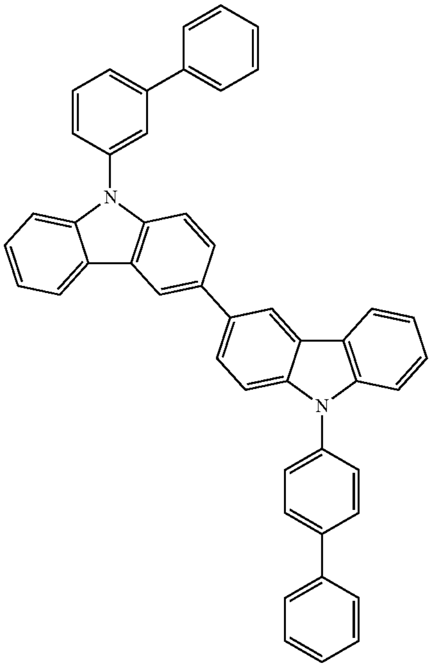
H1-10
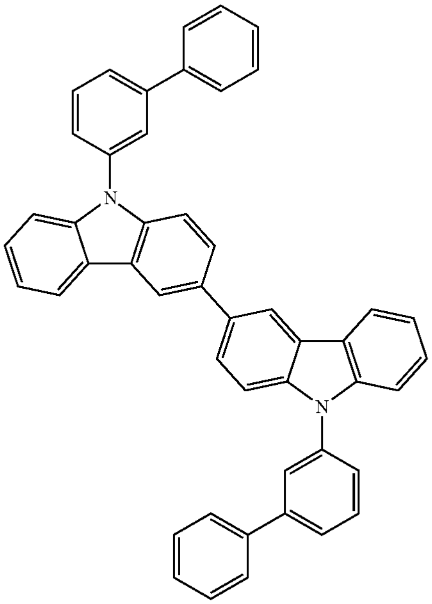

-continued
H1-11
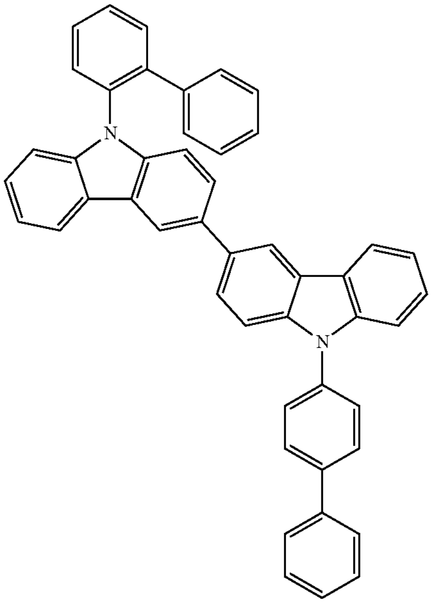
H1-12
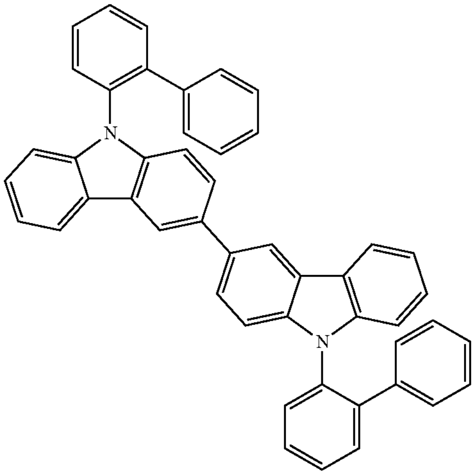
H1-13
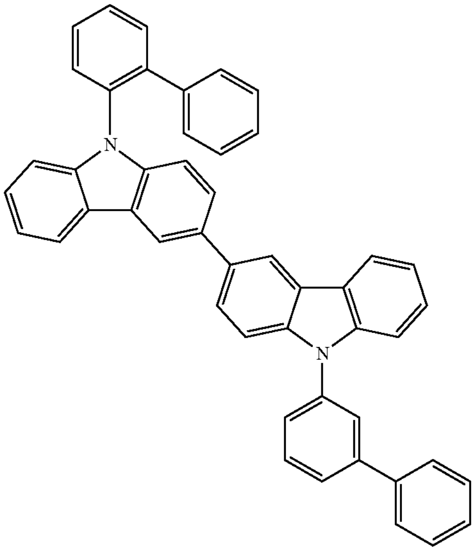
-continued
H1-14
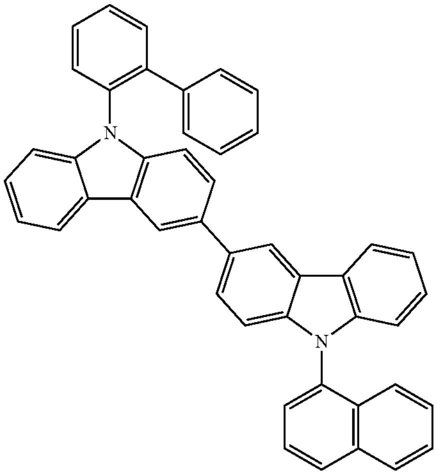
H1-15
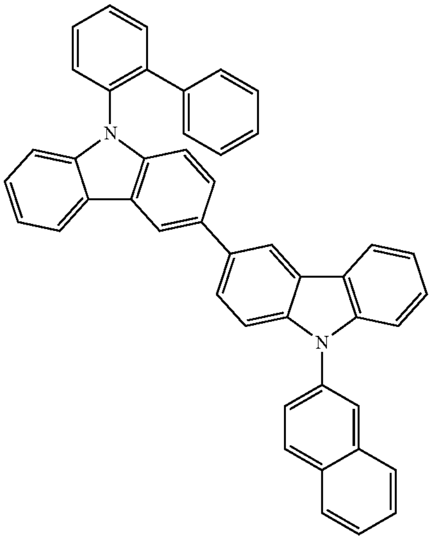
H1-16
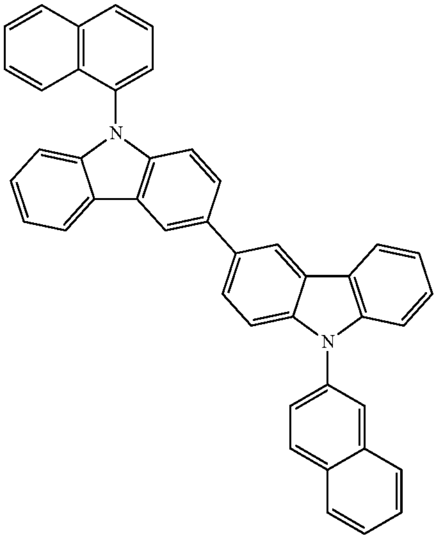

-continued
H1-17
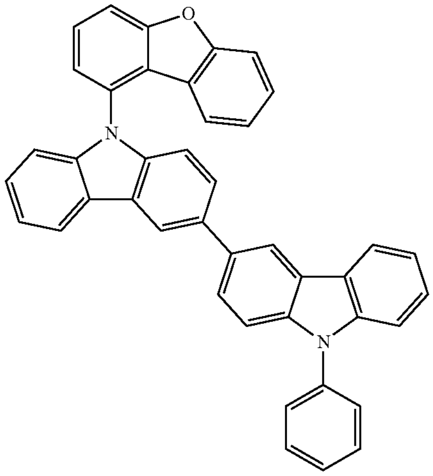
H1-18
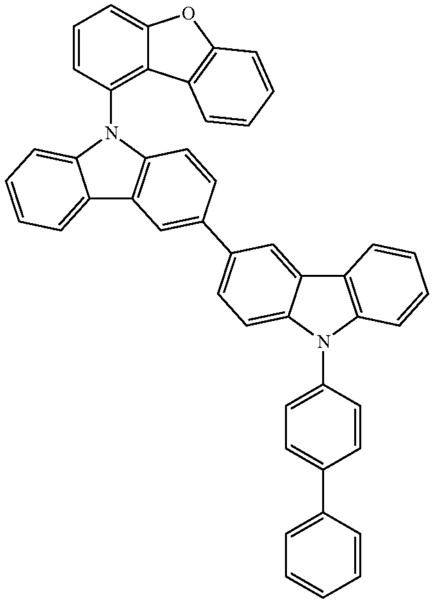
H1-19
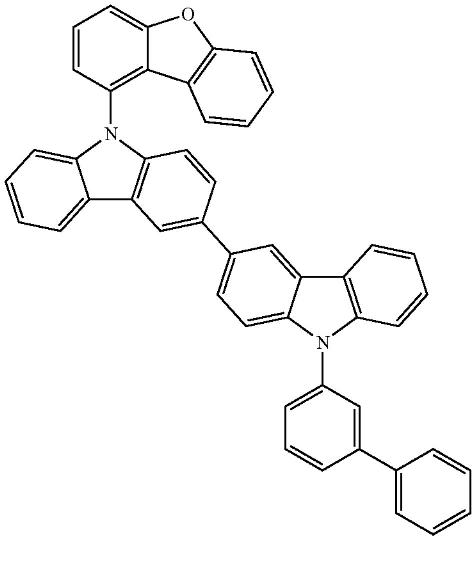
-continued
H1-20
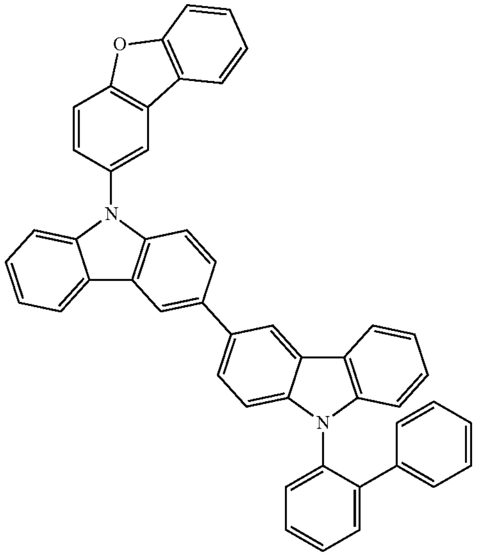
In one or more embodiments, the first compound may be at least one of Compounds E1-1 to E1-62:
E1-1
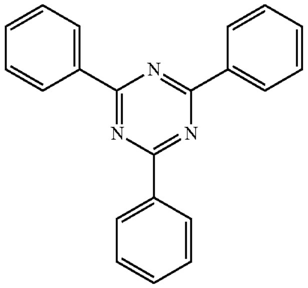
E1-2
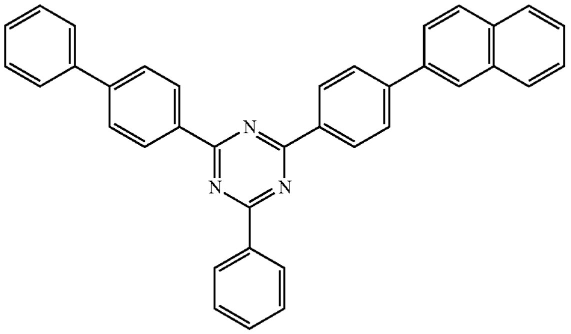

-continued
E1-3
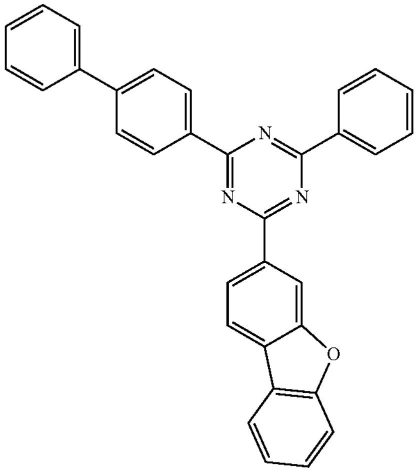
E1-4
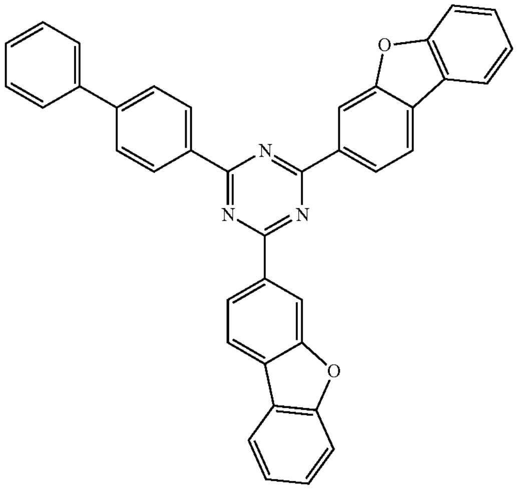
E1-5
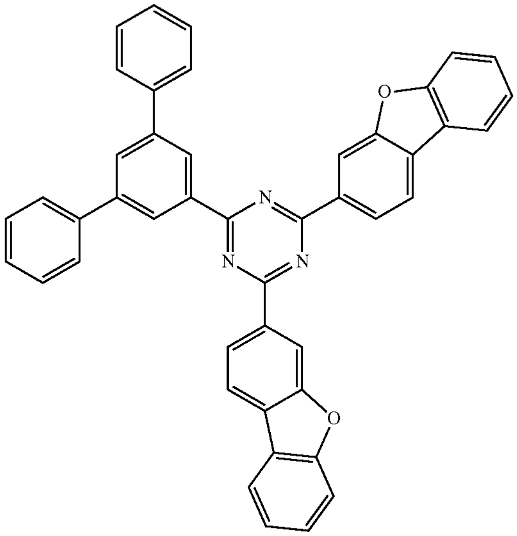
-continued
E1-6
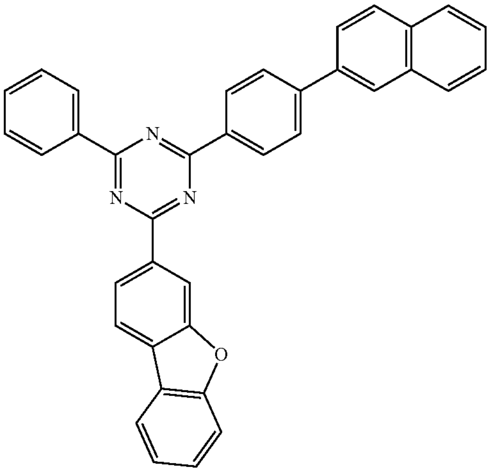
E1-7
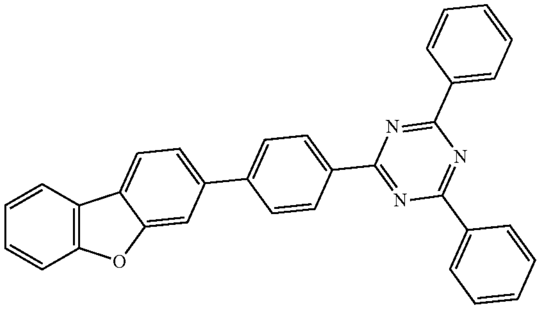
E1-8
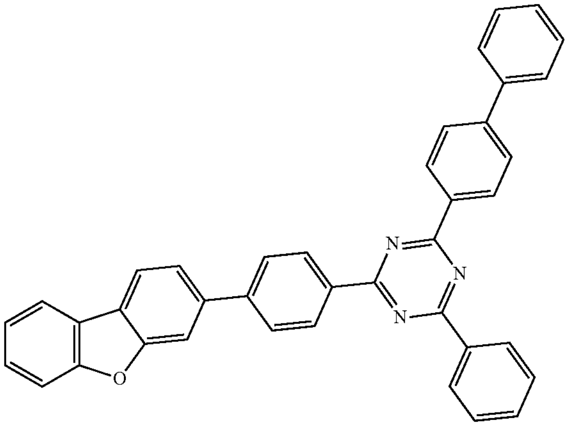
E1-9
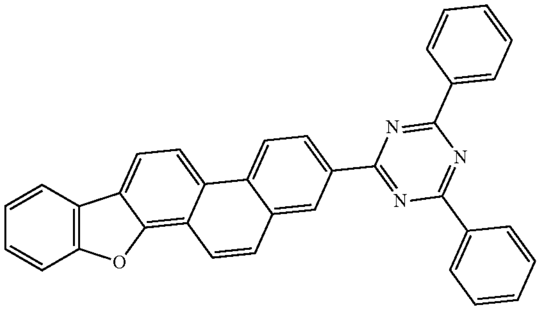

-continued
E1-10
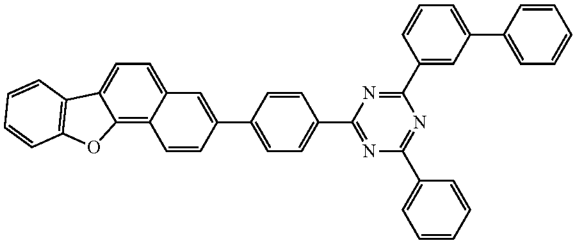
E1-11
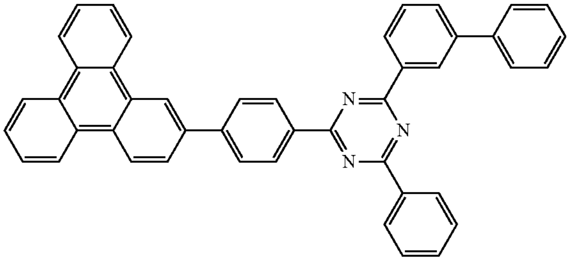
E1-12
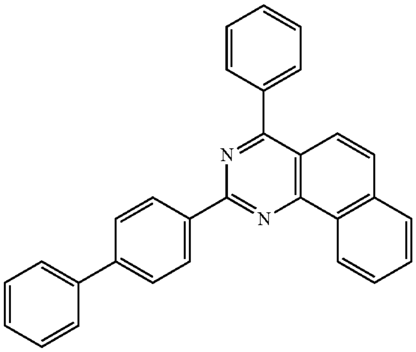
E1-13
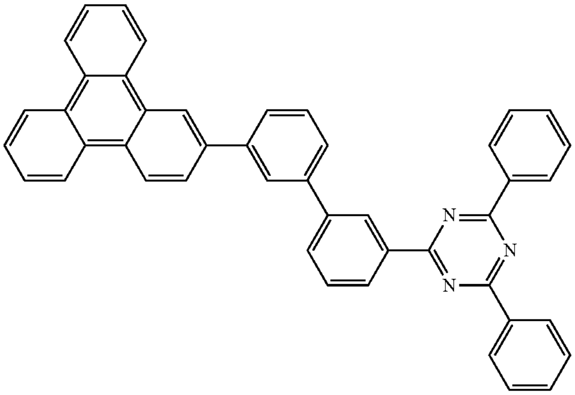
-continued
E1-14
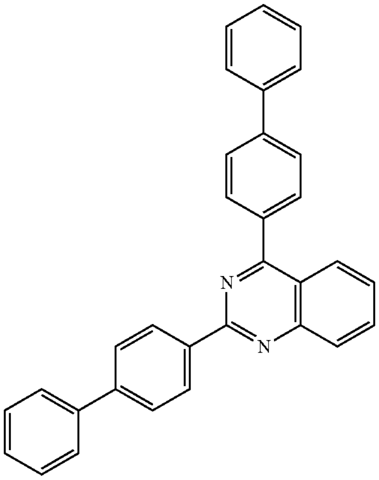
E1-15
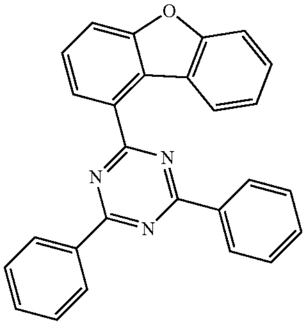
E1-16
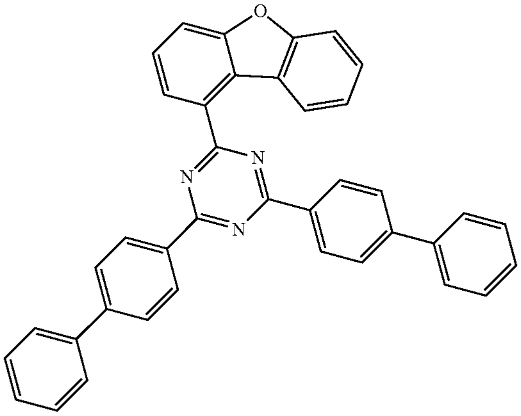
E1-17
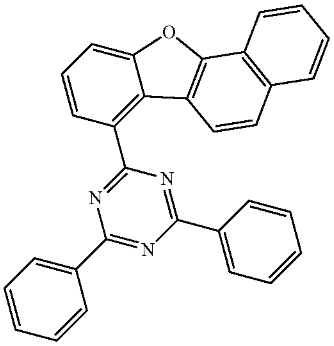

-continued
E1-18
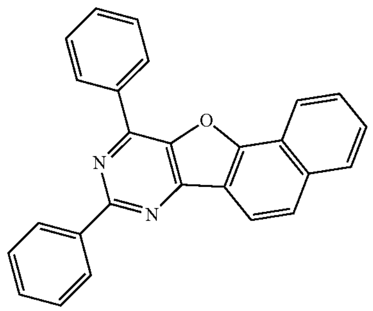
E1-19
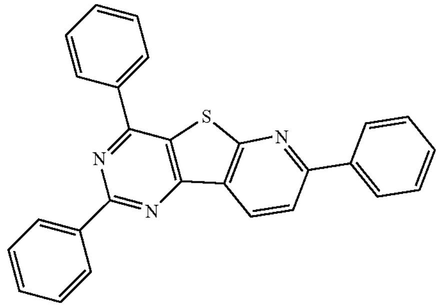
E1-20
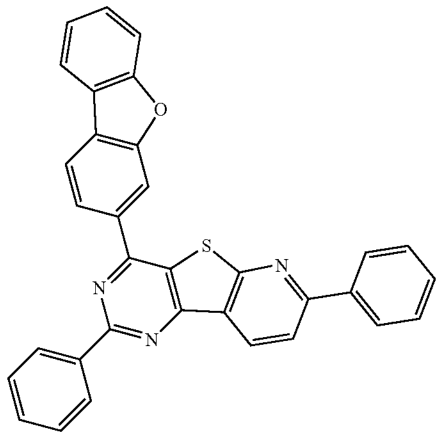
E1-21
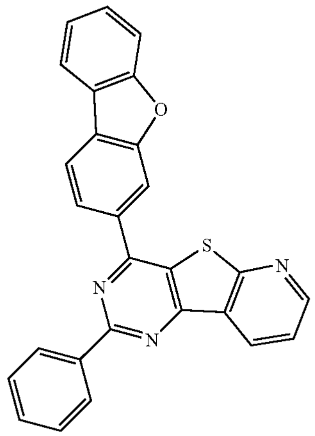
-continued
E1-22
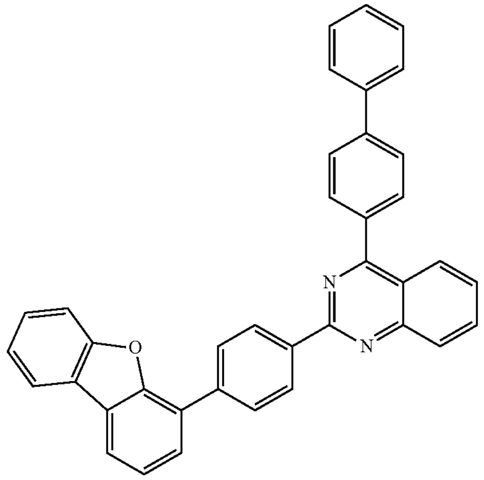
E1-23
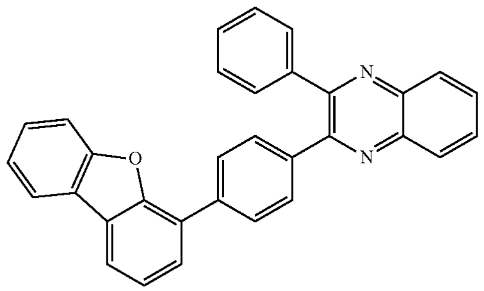
E1-24
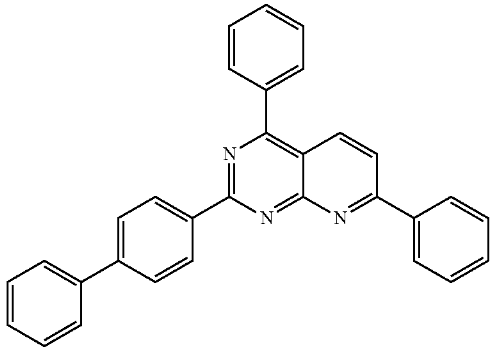
E1-25
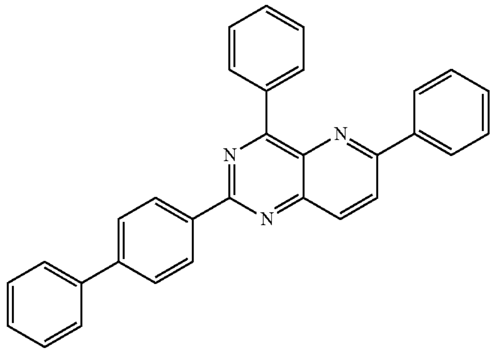

-continued
E1-26
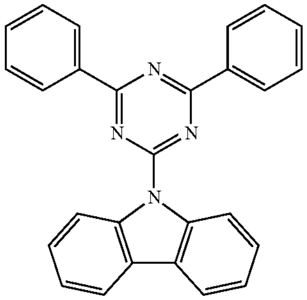
E1-27
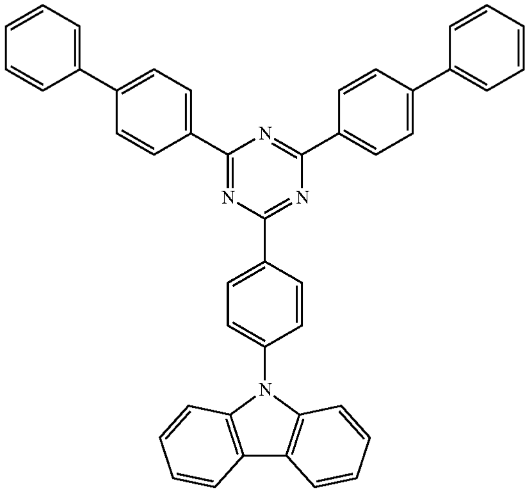
E1-28
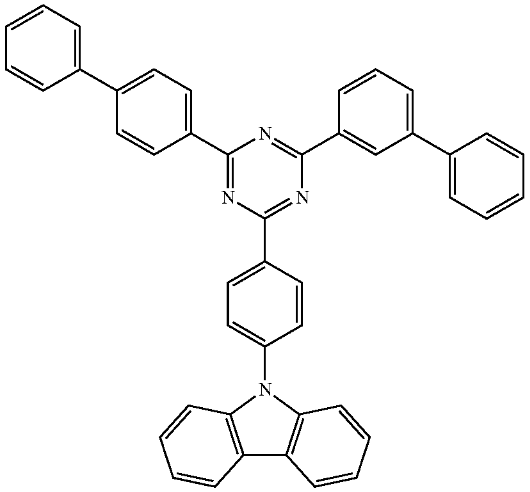
-continued
E1-29
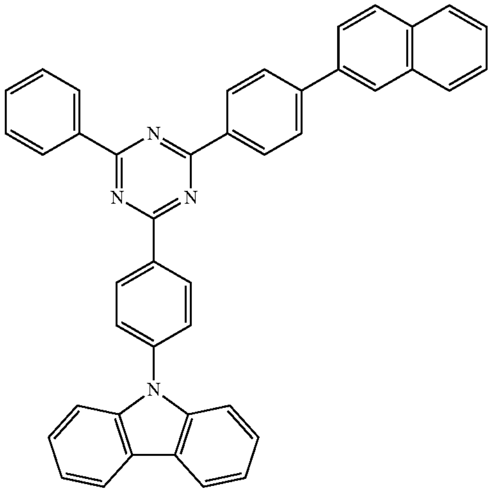
E1-30
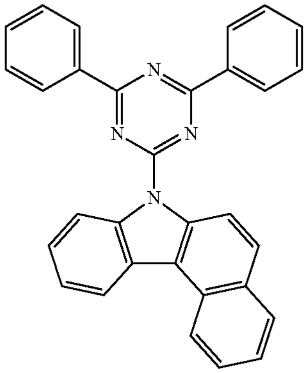
E1-31
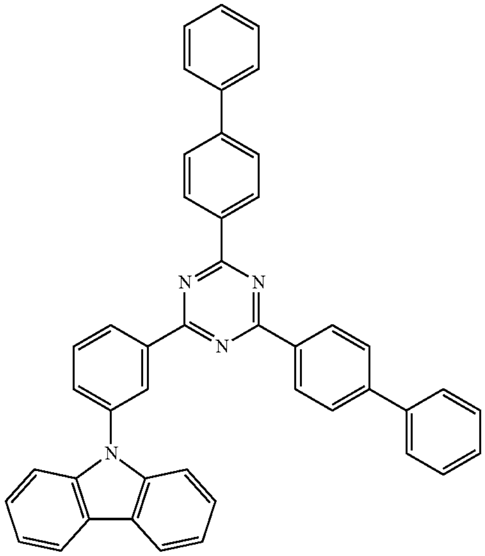

-continued
E1-32
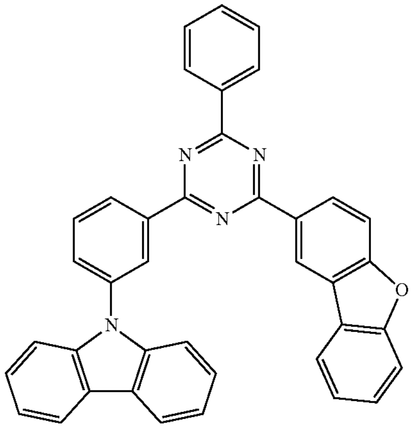
E1-33
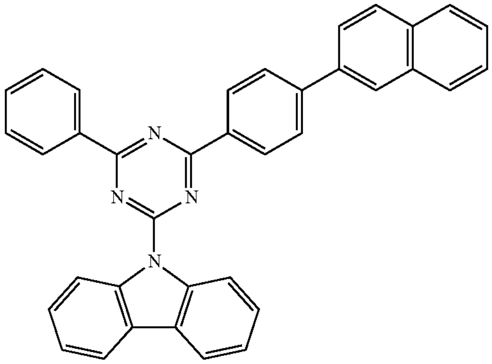
E1-34
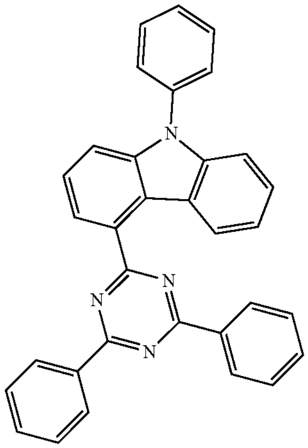
-continued
E1-35
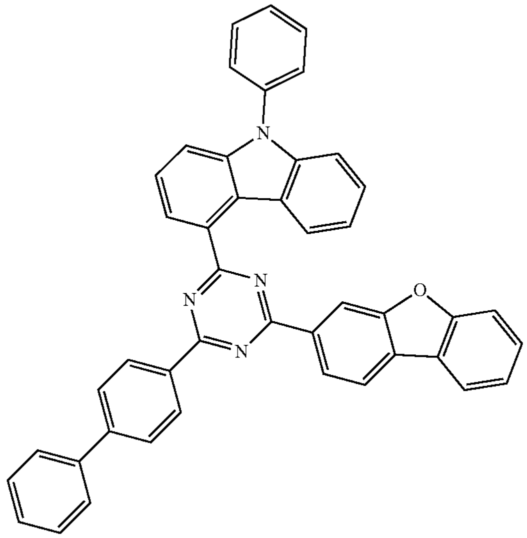
E1-36
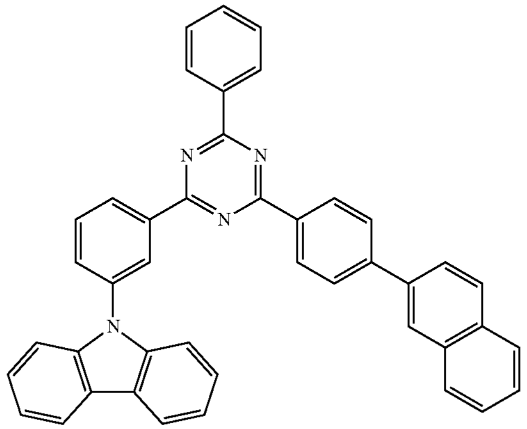
E1-37
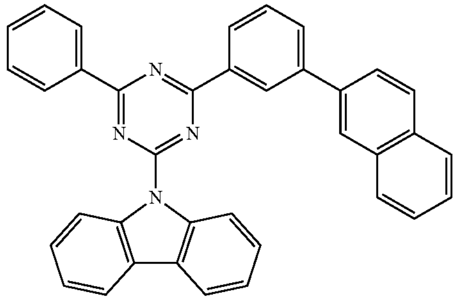

E1-38
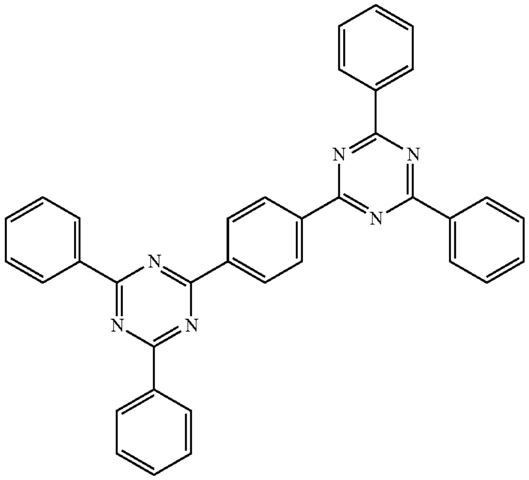
E1-39
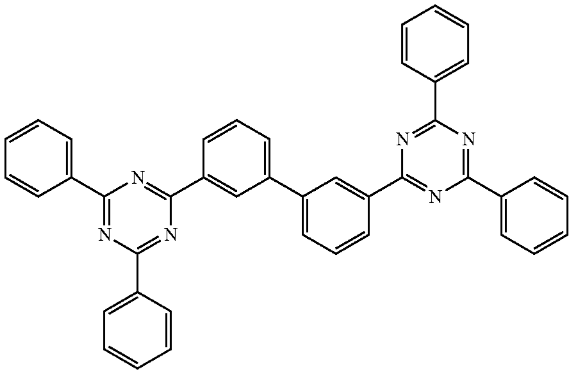
E1-40
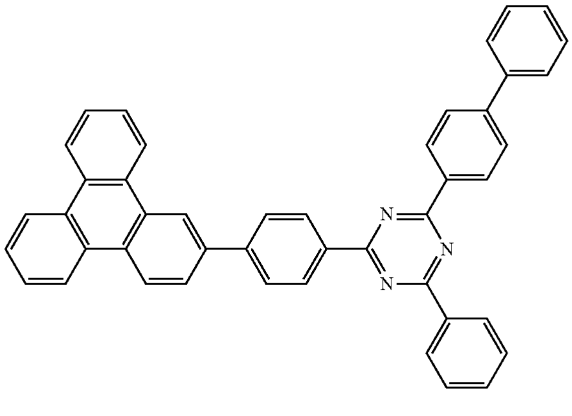
E1-41
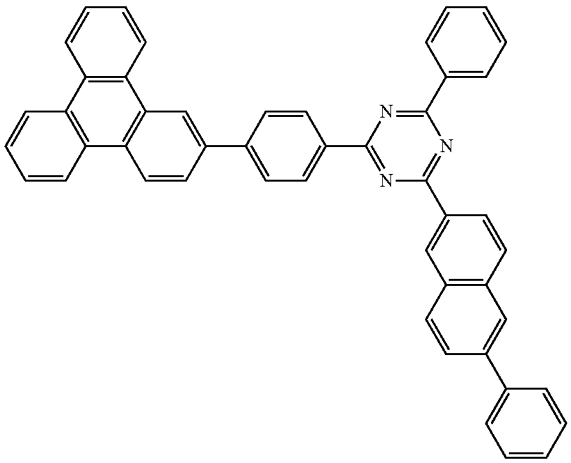
E1-42
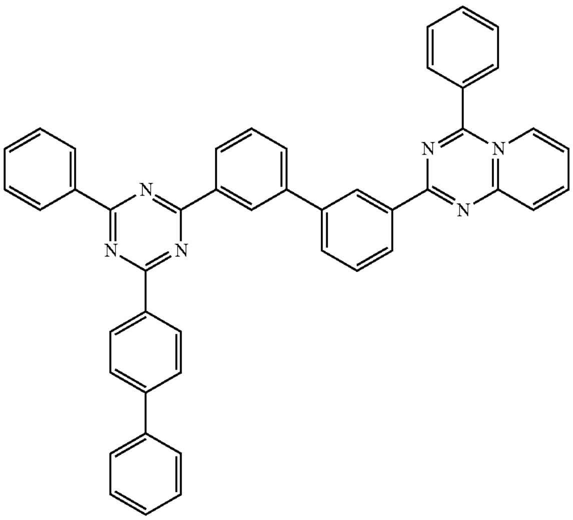
E1-43
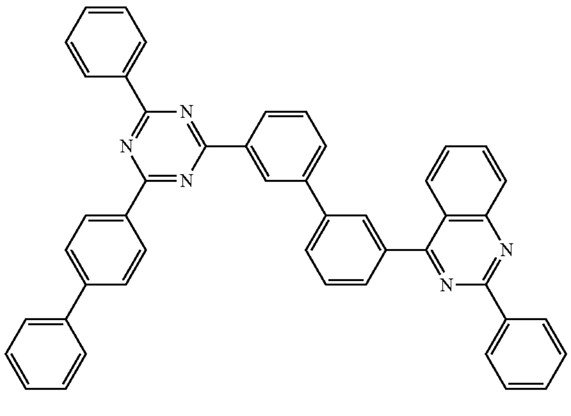

-continued
E1-44
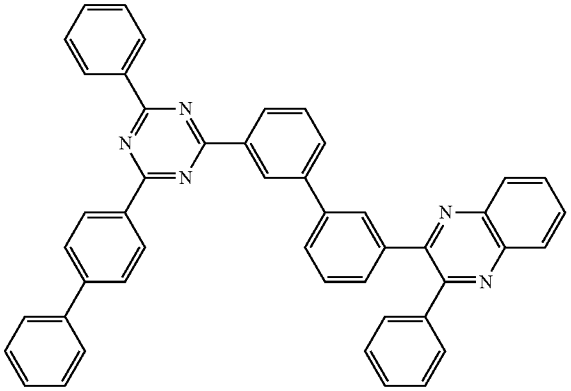
E1-45
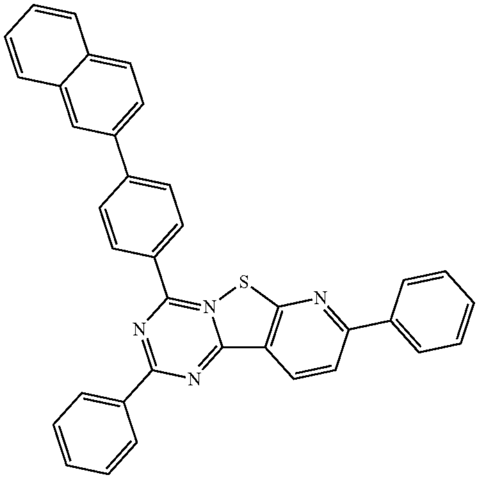
E1-46
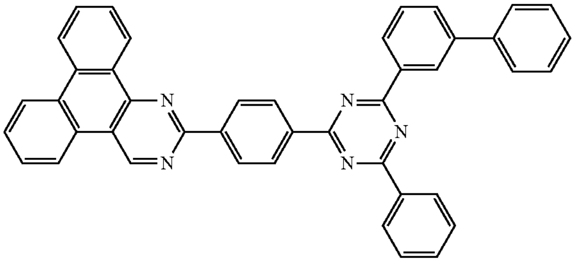
E1-47
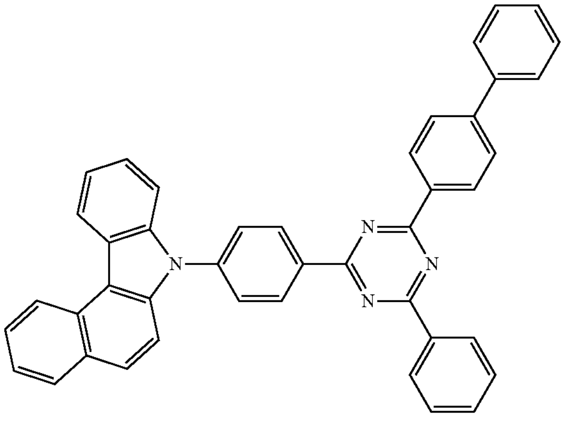
-continued
E1-48
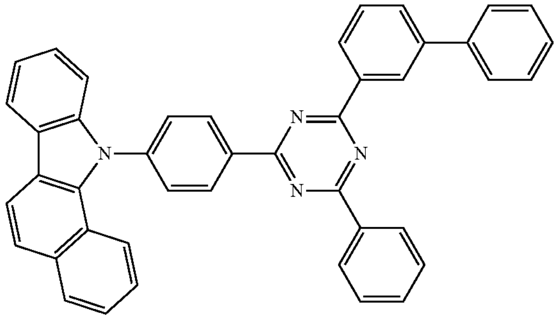
E1-49
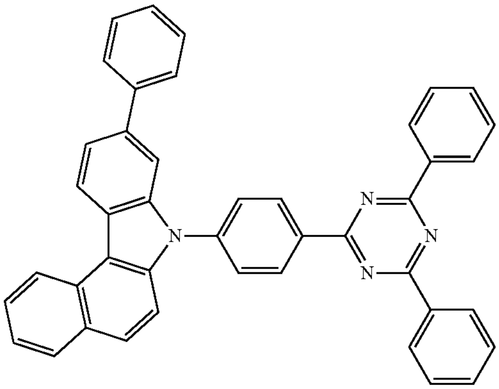
E1-50
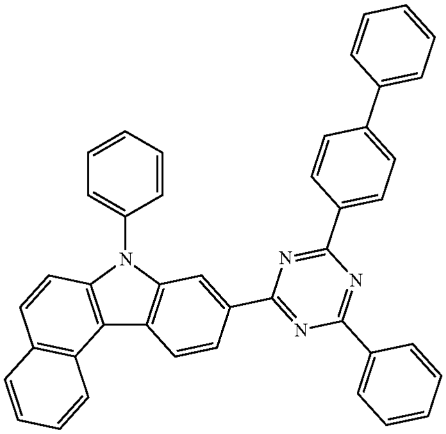

-continued
E1-51
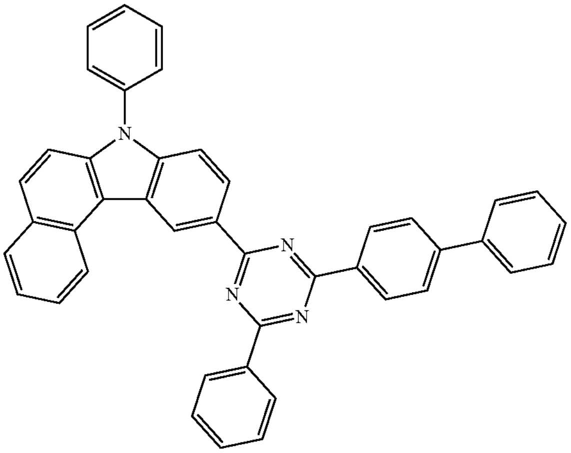
E1-52
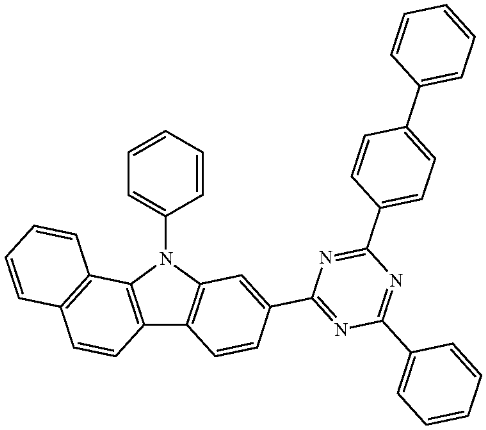
E1-53
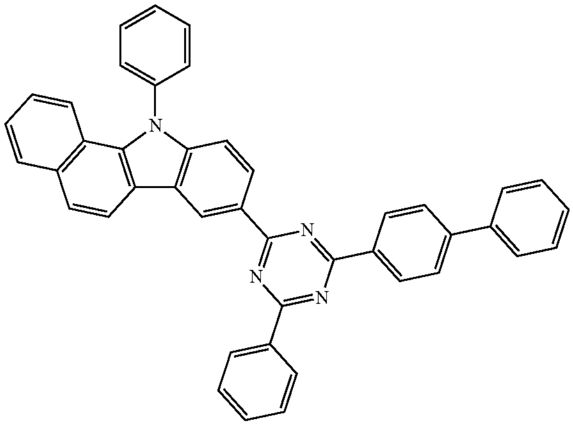
-continued
E1-54
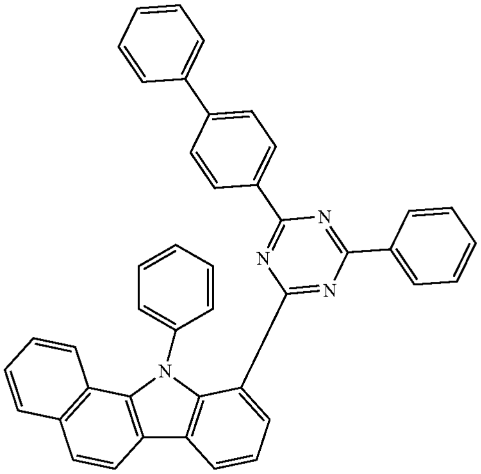
E1-55
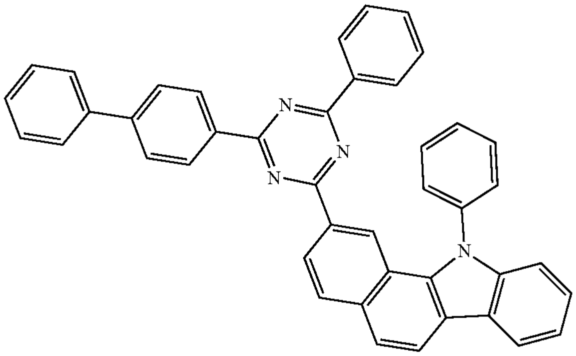
E1-56
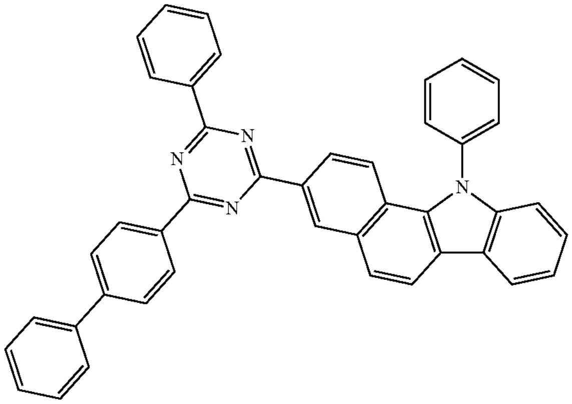

-continued
E1-57
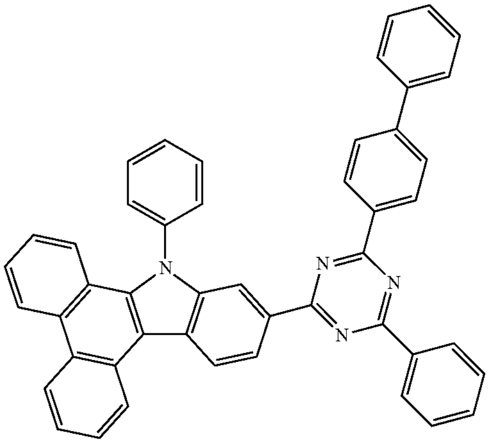
E1-58
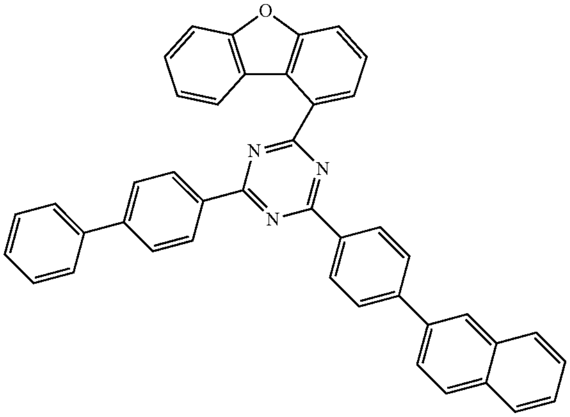
E1-59
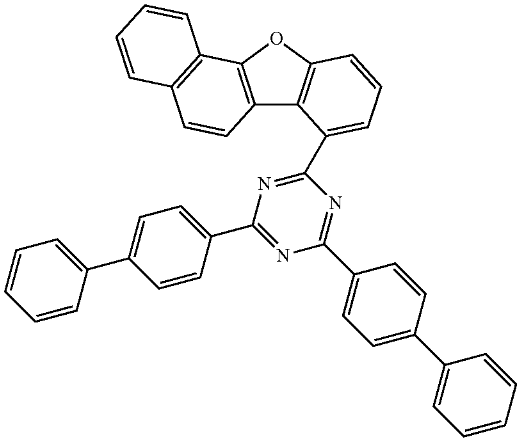
-continued
E1-60
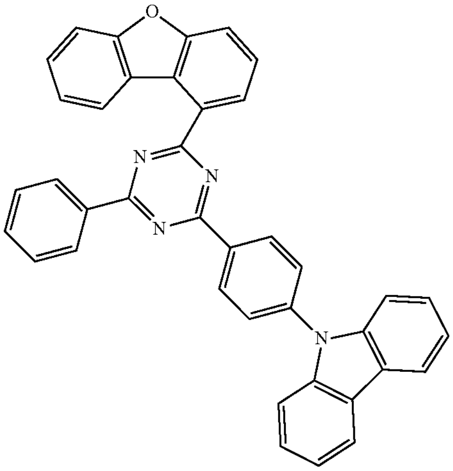
E1-61
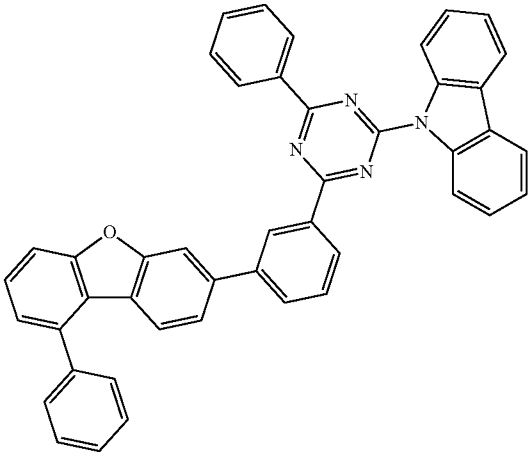
E1-62
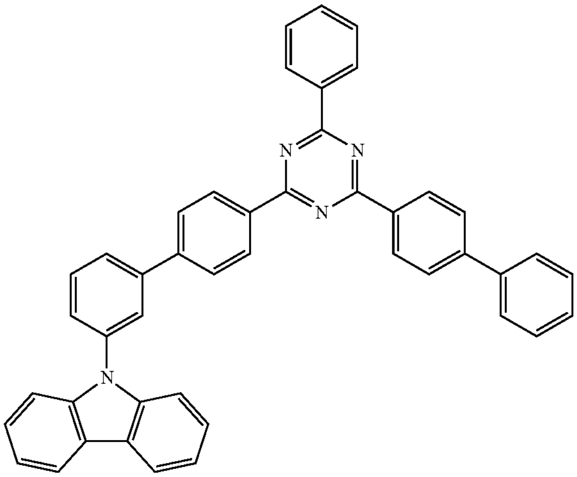

In one or more embodiments, the second compound may be at least one of Compounds BPI-1 to BPI-17:
BP1-1
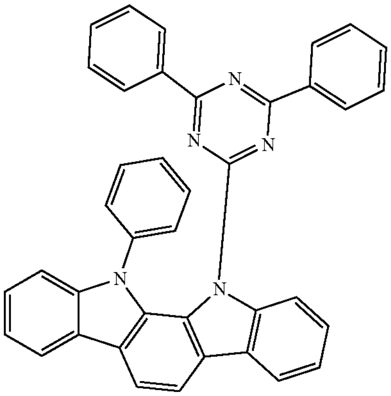
BP1-2
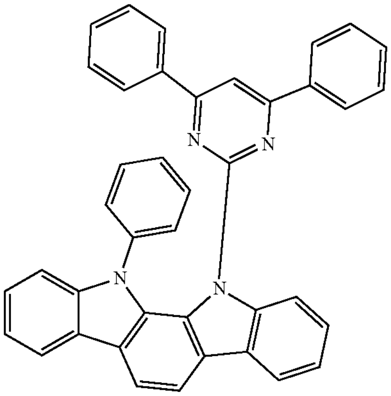
BP1-3
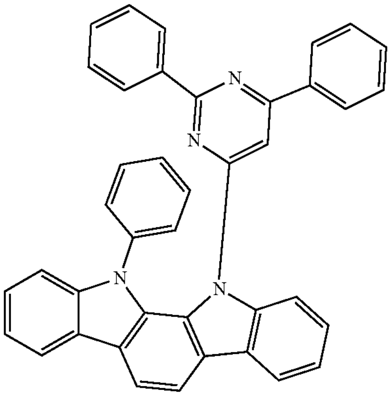
-continued
BP1-4
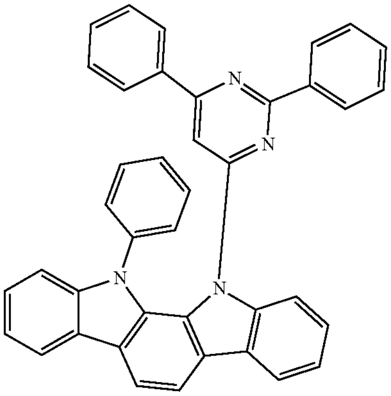
BP1-5
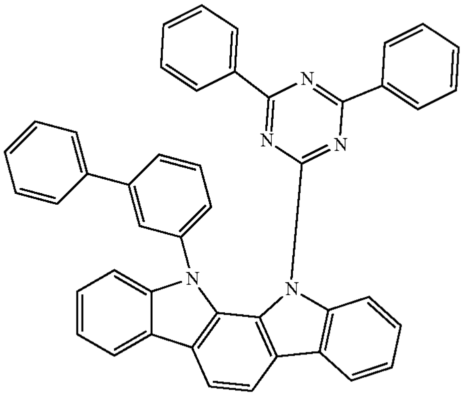
BP1-6
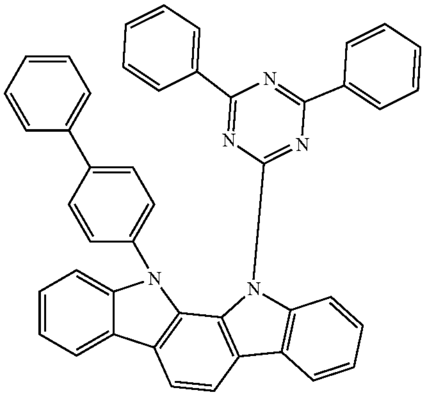
BP1-7
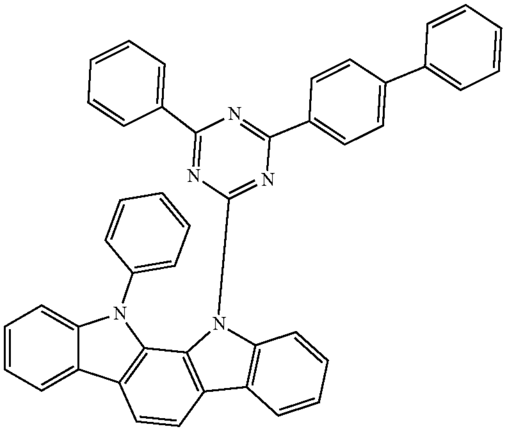

BP1-8
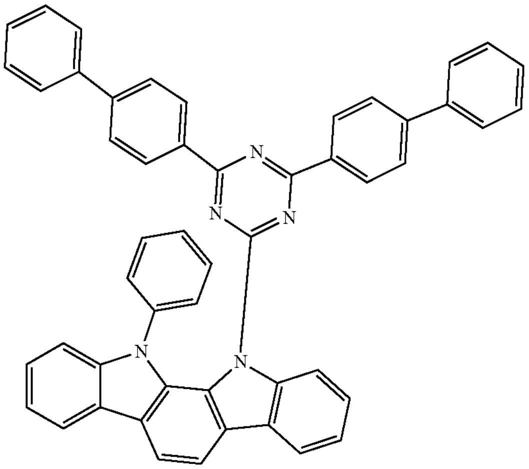
BP1-9
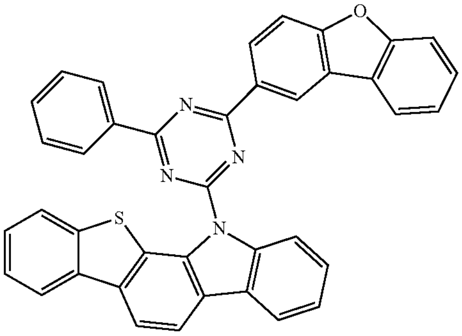
BP1-10
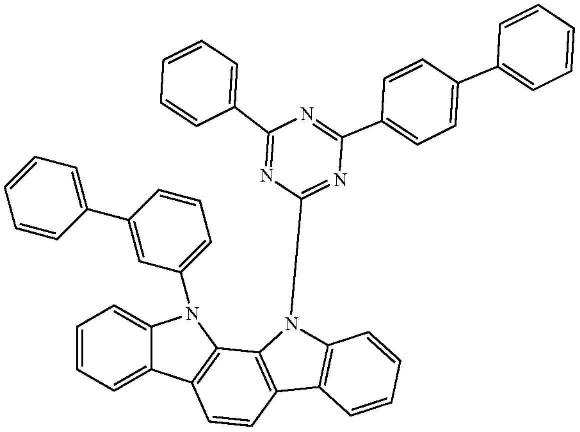
BP1-11
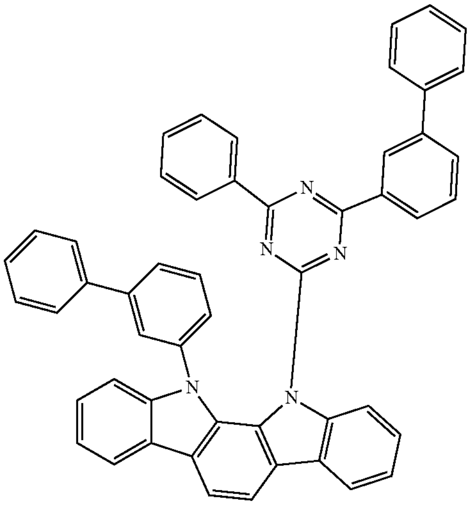
BP1-12
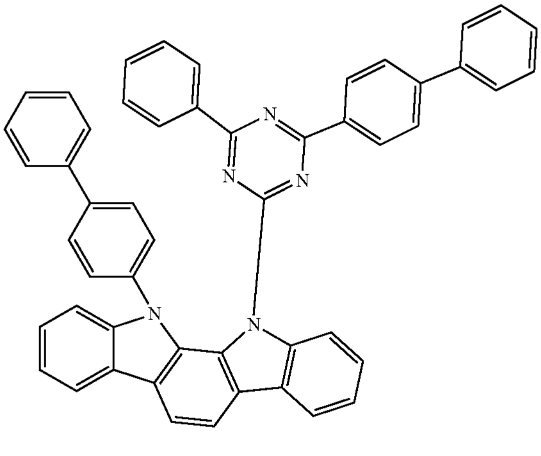
BP1-13
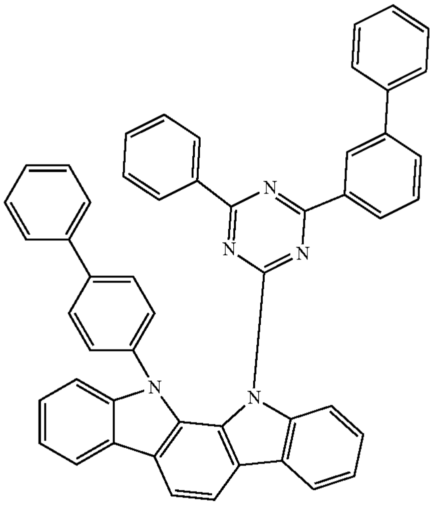

-continued

BP1-14

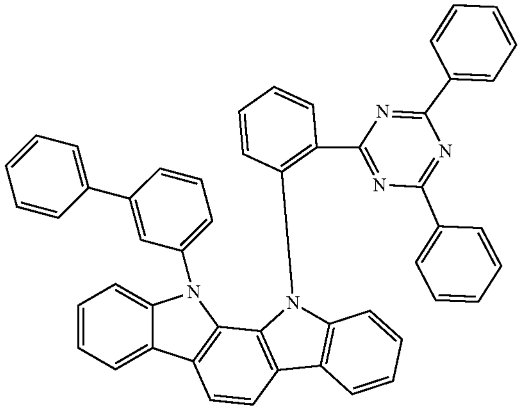

BP1-15

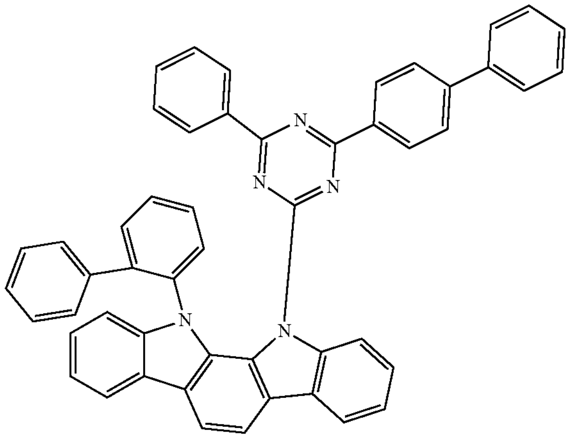

BP1-16

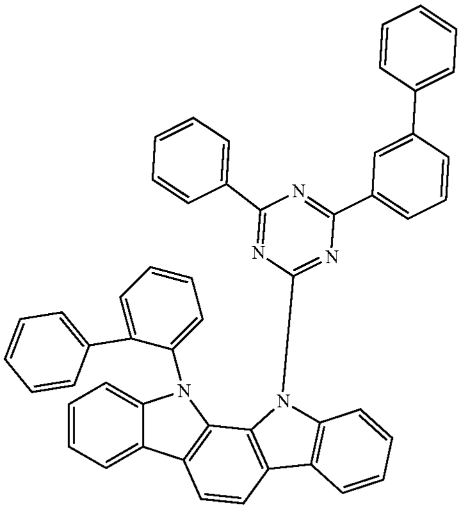

-continued

BP1-17

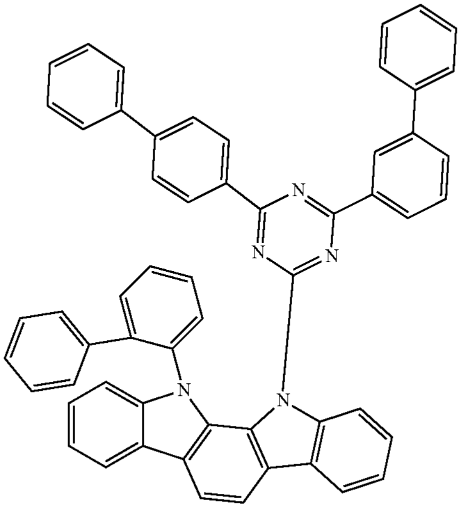

Figure 2:
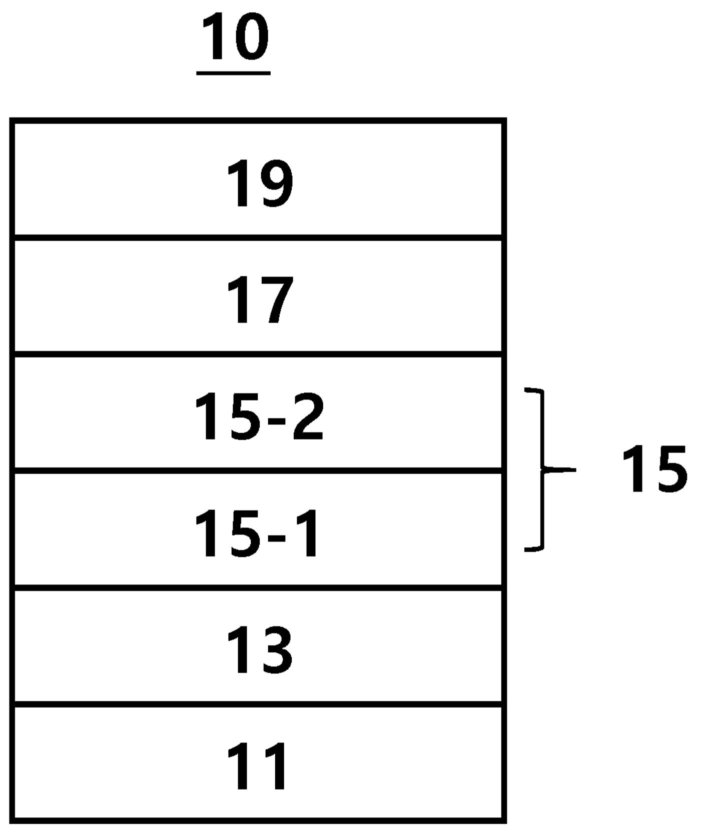
FIG. 2 is a schematic view of an organic light-emitting device according to an exemplary embodiment.

Description of FIG. 2

FIG. 2 schematically illustrates a cross-sectional view of an organic light-emitting device 10, which is a light-emitting device according to an embodiment. Hereinafter, the structure of an organic light-emitting device according to an embodiment of the present disclosure and a method of manufacturing an organic light-emitting device according to an embodiment of the present disclosure will be described in connection with FIG. 2.

The organic light-emitting device 10 of FIG. 2 includes a first electrode 11, a hole-transporting region 13, an emission layer 15, an electron-transporting region 17 and a second electrode 19, which are sequentially stacked. The emission layer 15 includes a first emission layer 15-1 and a second emission layer 15-2.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In ), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The hole-transporting region 13 may be located between the first electrode 11 and the emission layer 15.

The hole-transporting region 13 may include a hole injection layer, a hole-transporting layer, an electron-blocking layer, a buffer layer, or a combination thereof.

The hole-transporting region 13 may include only a hole injection layer or only a hole-transporting layer. In one or more embodiments, the hole-transporting region 13 may have a hole injection layer/hole-transporting layer structure or a hole injection layer/hole-transporting layer/electron-blocking layer structure, which are sequentially stacked in this stated order from the first electrode 11.

When the hole-transporting region 13 includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary depending on a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

The conditions for forming the hole-transporting layer and the electron-blocking layer may be the same as the conditions for forming the hole injection layer.

The hole-transporting region 13 may include m-MTDATA, TDATA, 2-TNATA, NPB, P—NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANI/CSA), polyaniline/poly(4-styrenesulfonate) (PANI/PSS), a compound represented by Formula 201 below, a compound represented by Formula 202 below, or any combination thereof:

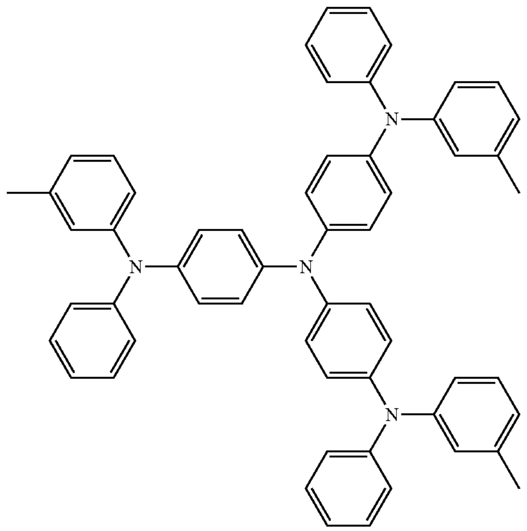

m-MTDATA

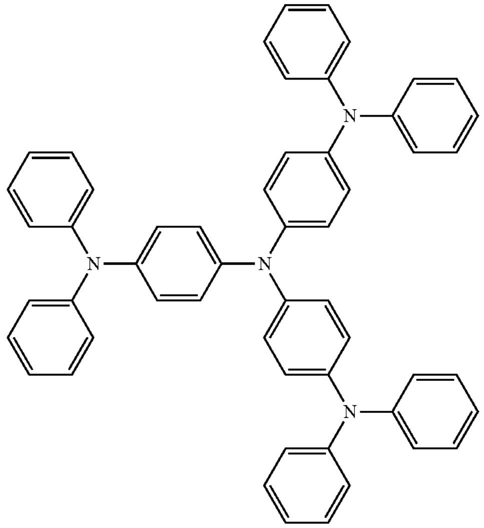

TDATA

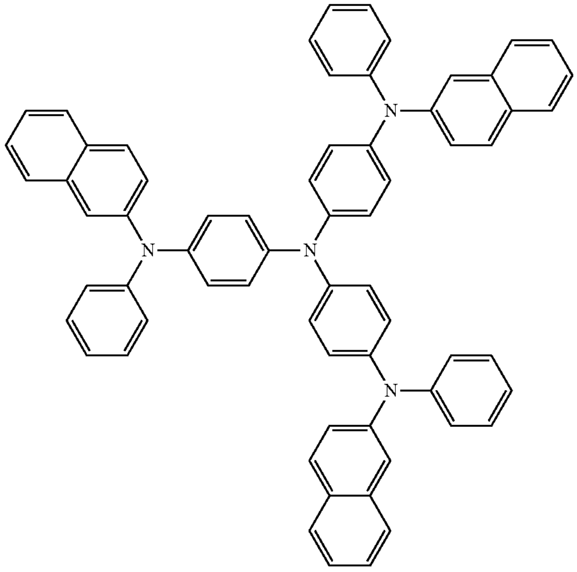

2-TNATA

-continued
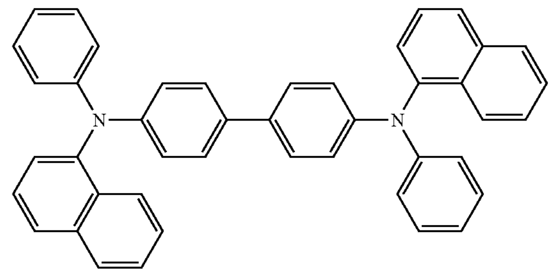
NPB
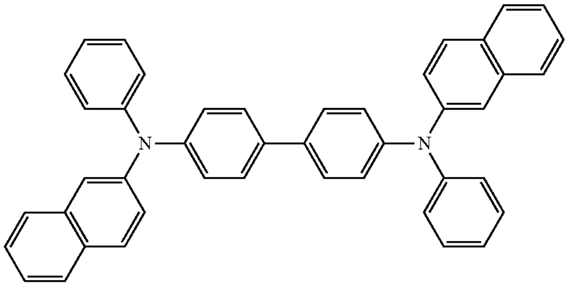
β-NPB
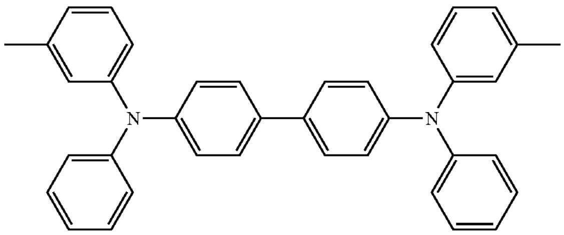
TPD
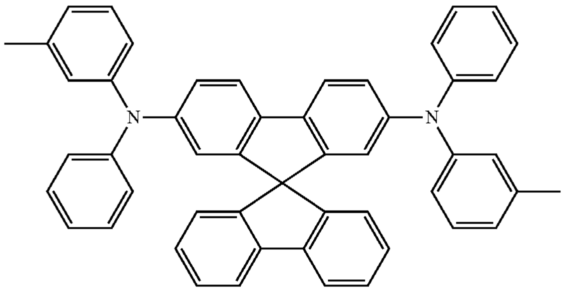
Spiro-TPD
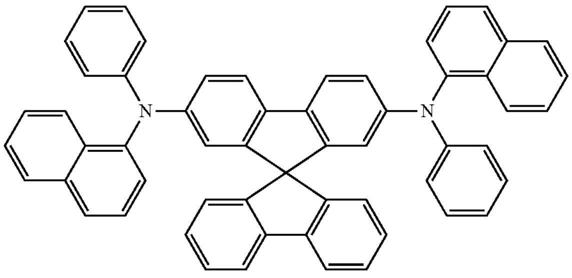
Spiro-NPB
-continued
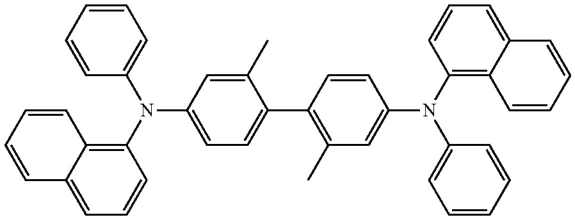
methylated NPB
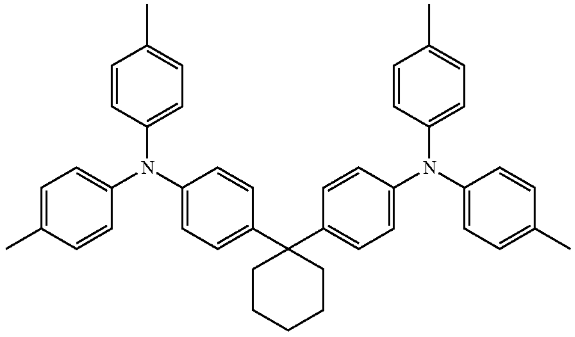
TAPC
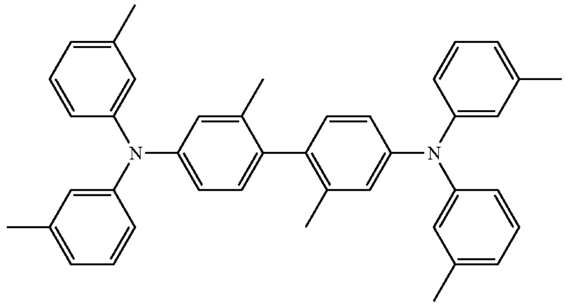
HMTPD
Formula 201
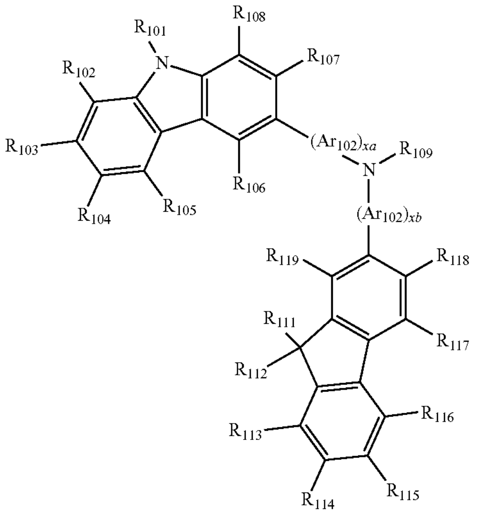

-continued

Formula 202

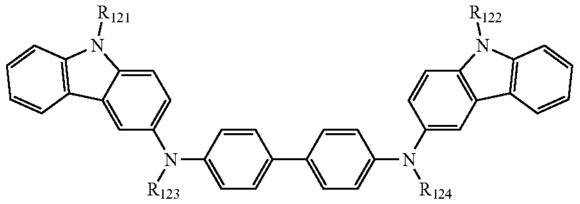

$Ar_{101}$ and $Ar_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

xa and xb in Formula 201 may each independently be an integer from 0 to 5, or 0, 1, or 2. For example, xa may be 1 and xb may be 0, but xa and xb are not limited thereto.

$R_{101}$ to $R_{108}$, $R_{111}$ to $R_{119}$ and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like) or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof.

$R_{109}$ in Formula 201 may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one or more embodiments, the compound represented by Formula 201 may be re resented b Formula 201A:

Formula 201A

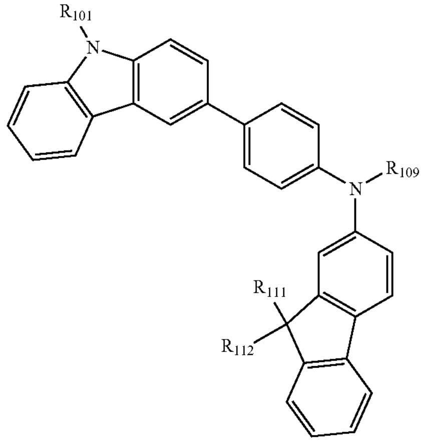

$R_{101}$, $R_{111}$, $R_{112}$, and $R_{109}$ in Formula 201A may be understood by referring to the description provided herein.

For example, the hole-transporting region 13 may include one of Compounds HT1 to HT20 or any combination thereof:

HT1

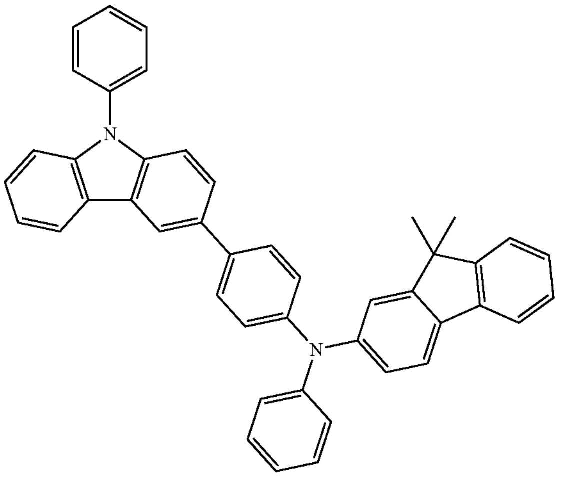

note: chem

-continued
HT2
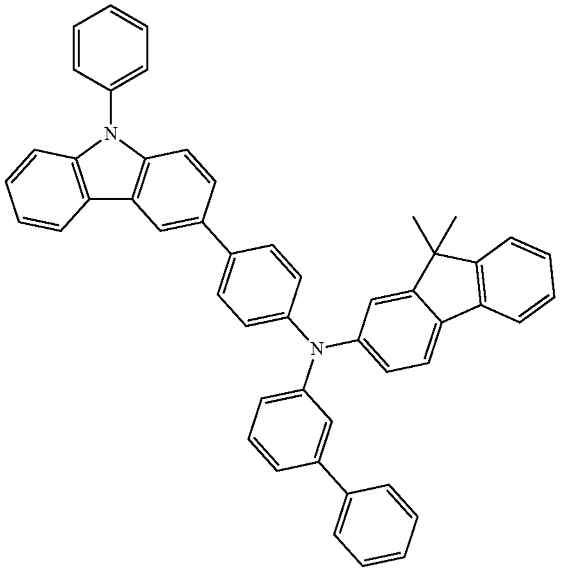
-continued
HT4
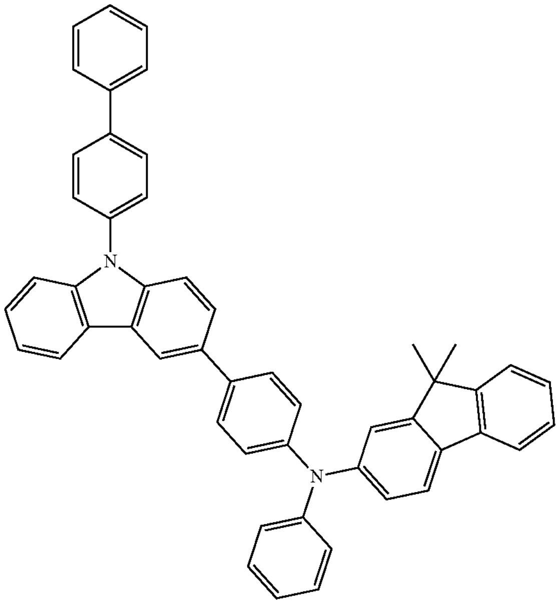
HT3
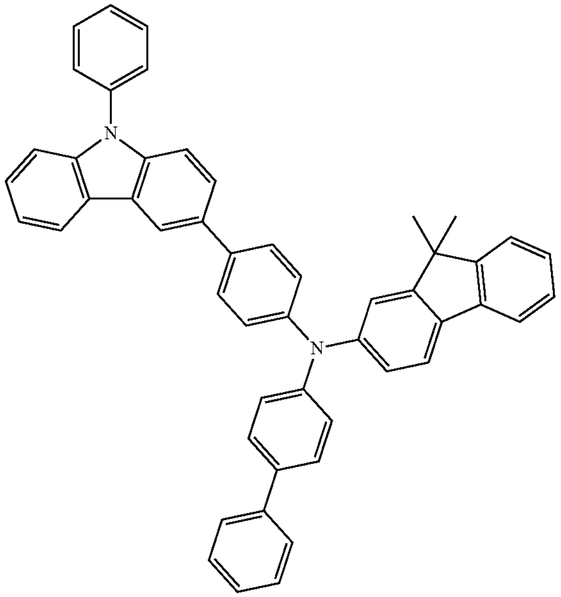
HT5
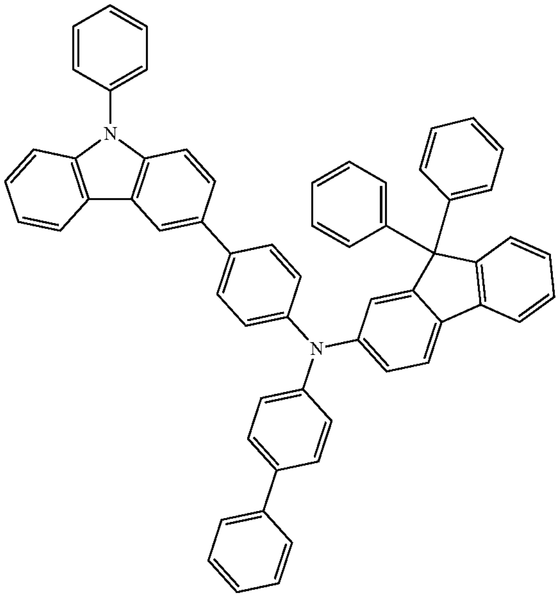

-continued
HT6
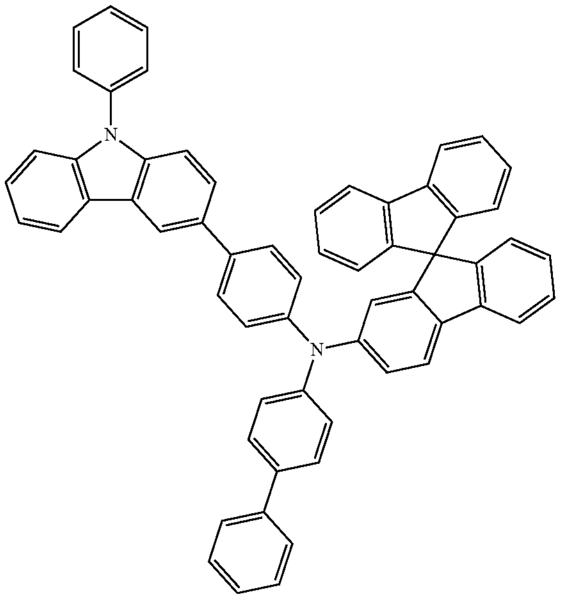
HT7
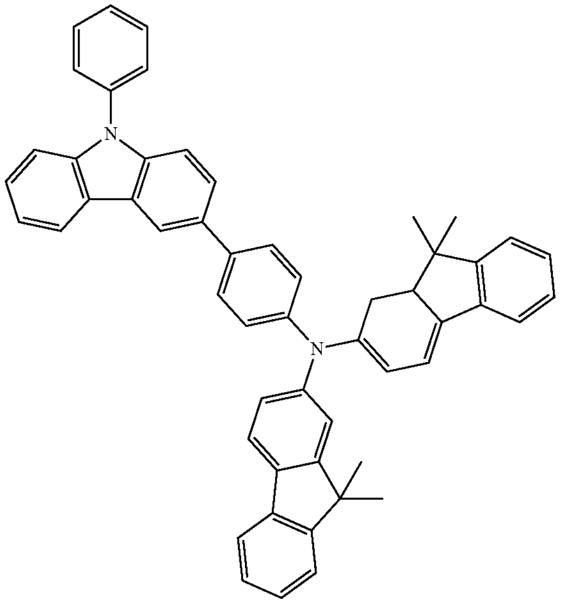
-continued
HT8
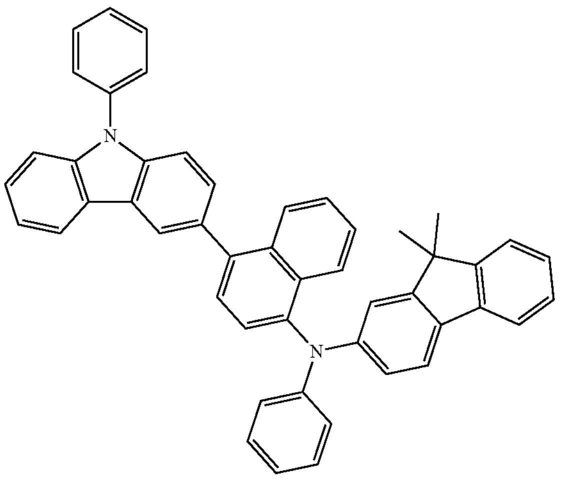
HT9
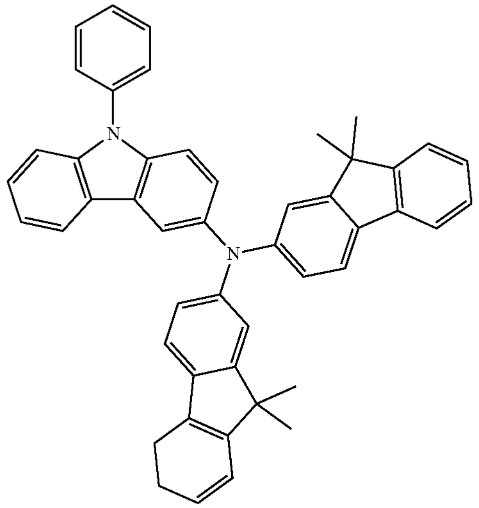
HT10
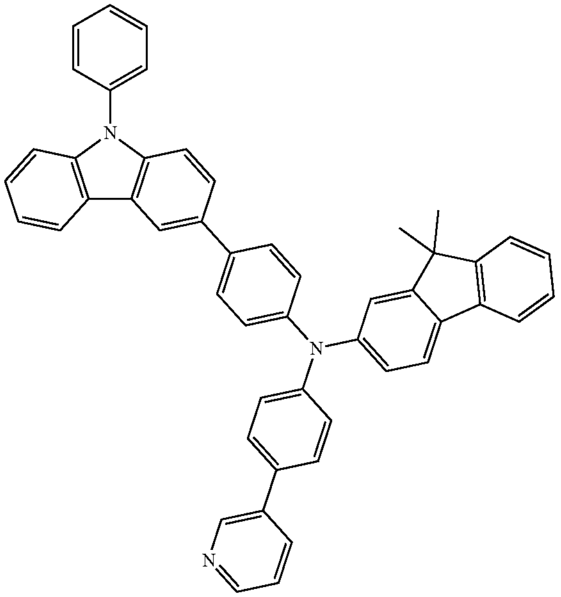

-continued
HT11
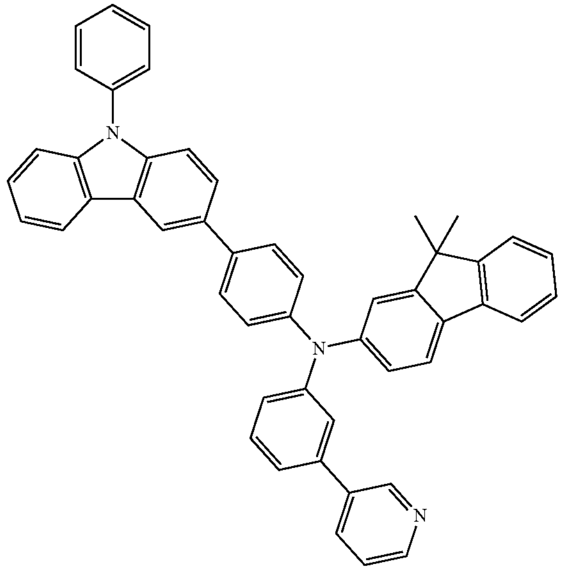
HT12
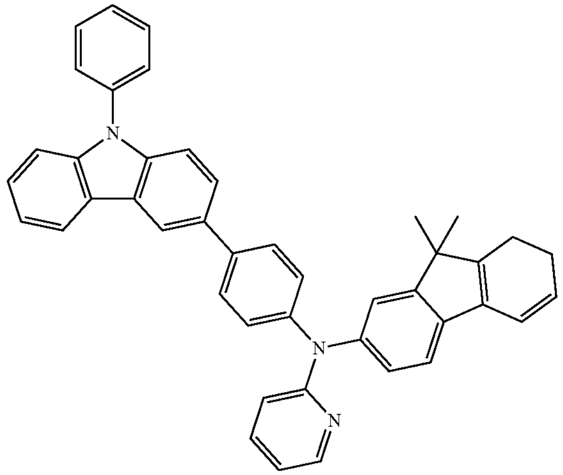
HT13
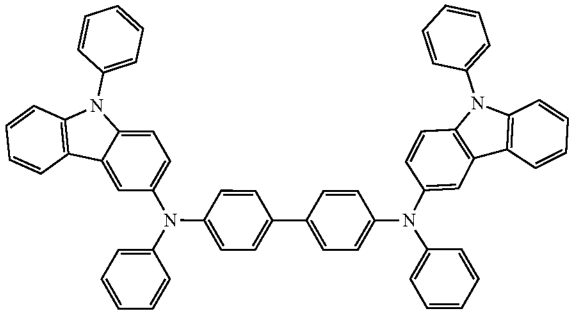
-continued
HT14
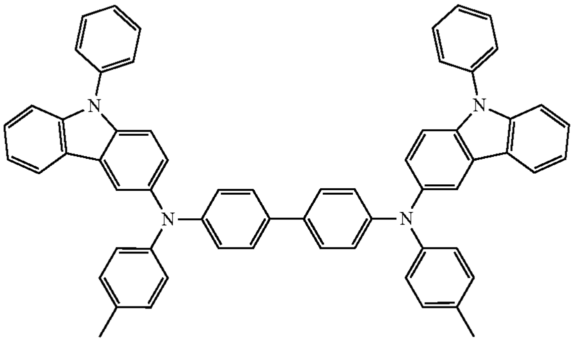
HT15
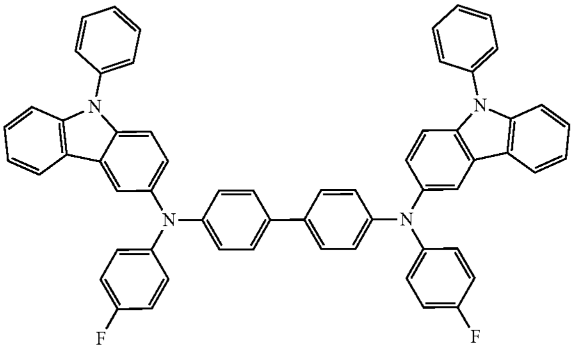
HT16
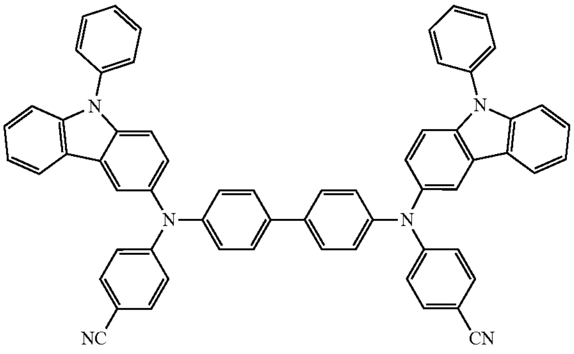
HT17
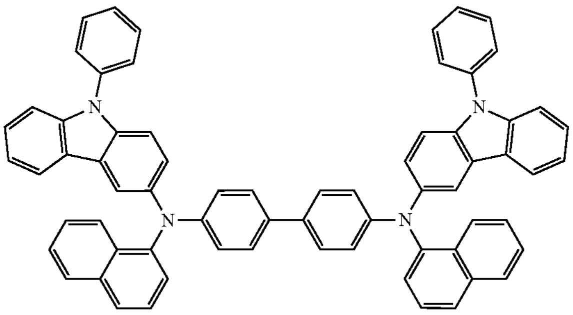

-continued

HT18

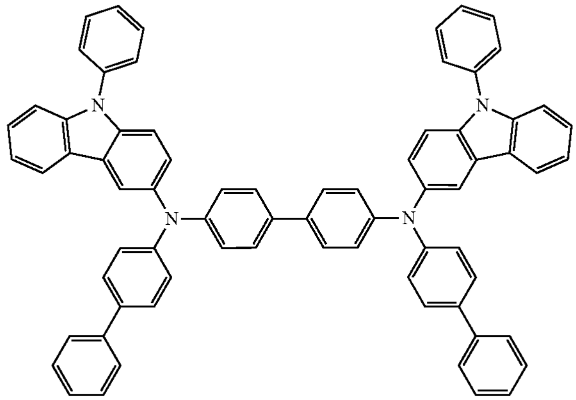

HT19

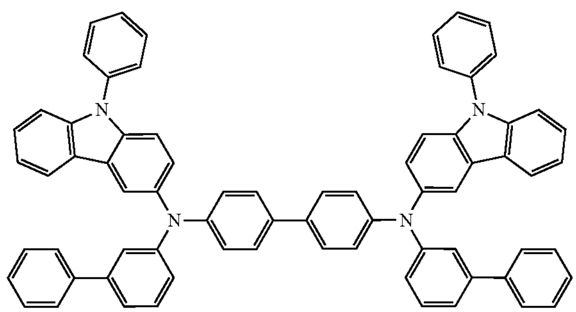

HT20

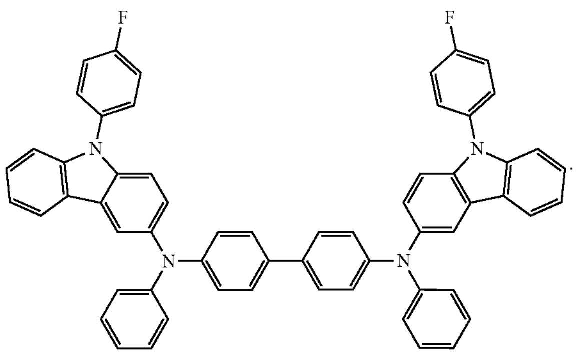

The thickness of the hole-transporting region 13 may be from about 100 Å to about 10000 Å, for example about 100 Å to about 1000 Å. When the hole-transporting region 13 includes a hole injection layer, a hole-transporting layer, an electron-blocking layer or a combination thereof, the thickness of the hole injection layer may be in a range of about 100 Å to about 10,000 Å, for example, about 100 Å to about 1,000 Å, and a thickness of the hole-transporting layer may be in a range of about 50 Å to about 2,000 Å, for example, about 100 Å to about 1,500 Å. When the thicknesses of the hole-transporting region, the hole injection layer and the hole-transporting layer are within these ranges, satisfactory hole-transporting characteristics may be obtained without a substantial increase in driving voltage.

In addition to the above-described materials, the hole-transporting region 13 may further include a charge-generation material to improve conductivity. The charge-generation material may be homogeneously or non-homogeneously dispersed in the hole-transporting region.

The charge-generation material may be, for example, a p-dopant. The p-dopant may include a quinone derivative, a metal oxide, a cyano group-containing compound, or any combination. For example, the p-dopant may be: a quinone derivative such as tetracyanoquinonedimethane (TCNQ), 2,3,5,6-tetrafluoro-tetracyano-1,4-benzoquinonedimethane (F4-TCNQ), or F6-TCNNQ; metal oxide, such as tungsten oxide and molybdenum oxide; a cyano group-containing compound, such as Compound HT-D1; or any combination thereof.

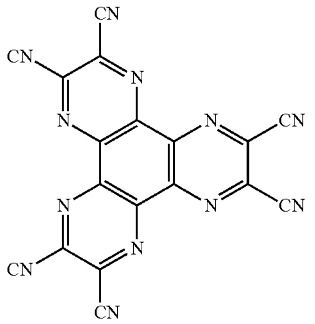

HT-D1

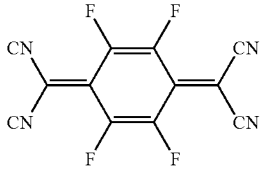

F4-TCNQ

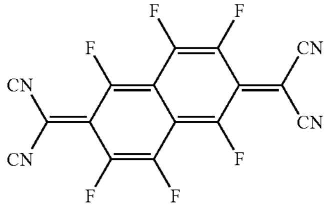

F6-TCNNQ

The hole-transporting region 13 may further include a buffer layer.

Also, the buffer layer may compensate for an optical resonance distance according to a wavelength of light emitted from the emission layer, and thus, efficiency of a formed organic light-emitting device may be improved.

Meanwhile, when the hole-transporting region 13 includes an electron-blocking layer, the material for the electron-blocking layer may include a material that can be used in the hole-transporting region 13 as described above, a host material, or a combination thereof. For example, when the hole-transporting region includes an electron-blocking layer, mCP, Compound H1-8 of [Group 5-2], or the like may be used as a material for the electron-blocking layer.

The emission layer 15 may be formed on the hole-transporting region 13 by using, for example, a vacuum deposition method, a spin coating method, a cast method, or an LB method. When the emission layer 15 is formed by vacuum deposition or spin coating, the deposition or coating conditions may be similar to those applied in forming the hole injection layer although the deposition or coating conditions may vary depending on a material that is used to form the emission layer.

The emission layer 15 may include a first emission layer 15-1 and a second emission layer 15-2 as described herein.

The amount (weight) of the dopant in the first emission layer 15-1 may be from about 0.01 to about 20 parts by weight based on 100 parts by weight, which is the total weight of the first hole-transporting compound and the first compound.

The amount (weight) of the dopant in the second emission layer 15-2 may be from about 0.01 to about 20 parts by weight based on 100 parts by weight, which is the total weight of the second hole-transporting compound and the second compound.

A thickness of the emission layer 15 may be in a range of about 100 Å to about 1,000 Å, for example, about 200 Å to about 600 Å. When the thickness of the emission layer 15 is within these ranges, excellent light-emission characteristics may be obtained without a substantial increase in driving voltage.

Next, the electron-transporting region 17 may be located on the emission layer 15.

The electron-transporting region 17 may include a hole-blocking layer, an electron-transporting layer, an electron injection layer, or a combination thereof.

For example, the electron-transporting region 17 may have a hole-blocking layer/electron-transporting layer/electron injection layer structure or an electron-transporting layer/electron injection layer structure. The electron-transporting layer may have a single-layered structure or a multi-layered structure including two or more different materials.

The conditions for the formation of the hole-blocking layer, the electron-transporting layer and the electron injection layer in the electron-transporting region 17 are the same as the conditions for the formation of the hole injection layer.

When the electron-transporting region 17 includes a hole-blocking layer, the hole-blocking layer may include, for example, at least one of the following BCP, Bphen and BAlq.

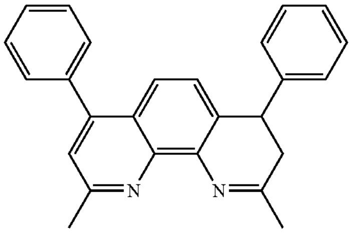

BCP

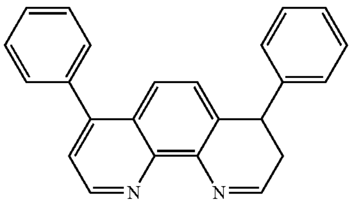

Bphen

In one or more embodiments, the hole-blocking layer may include any host material, and a material for an electron-transporting layer, a material for an electron injection layer, or a combination thereof, which will be described later.

A thickness of the hole-blocking layer may be in a range of about 20 Å to about 1,000 Å, for example, about 30 Å to about 300 Å. When the thickness of the hole-blocking layer is within these ranges, excellent hole-blocking characteristics can be obtained without a substantial increase in driving voltage.

The electron-transporting layer may include BCP, Bphen, TPBi, $Alq_3$, Balq, TAZ, NTAZ, or any combination thereof:

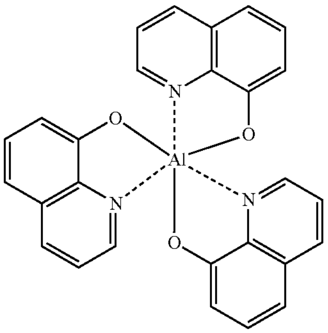

Alq3

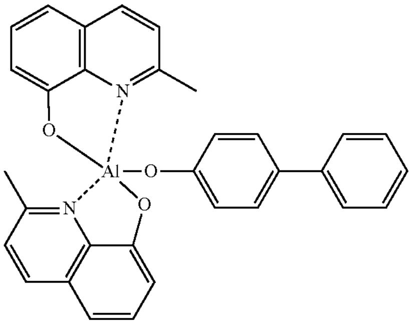

BAlq

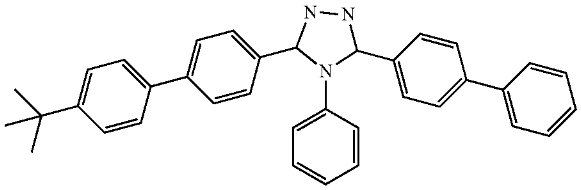

TAZ

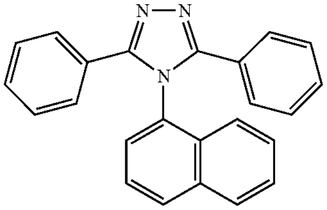

NTAZ

In one or more embodiments, the electron-transporting layer may include at least one of Compounds ET1 to ET25.

ET1
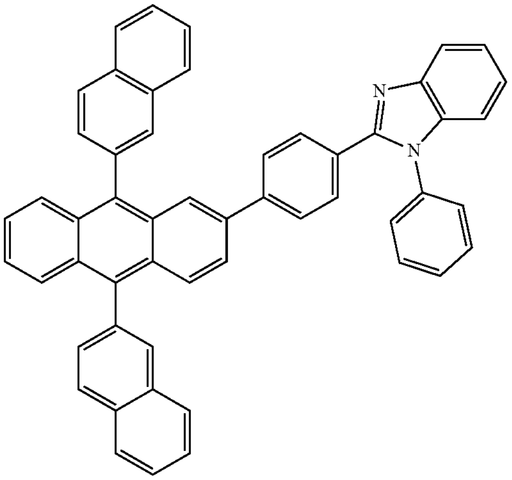
ET2
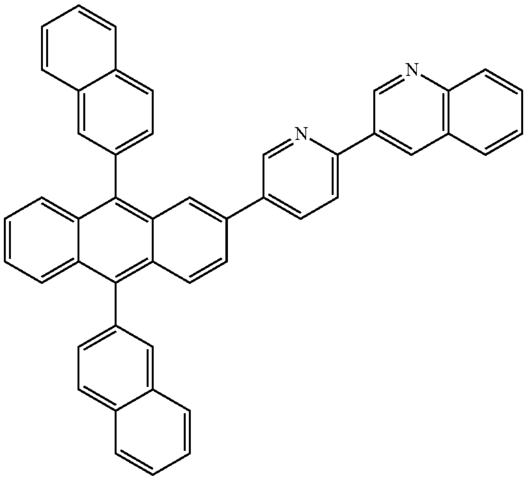
ET3
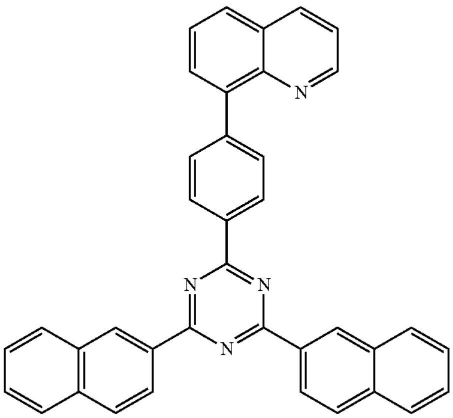
-continued
ET4
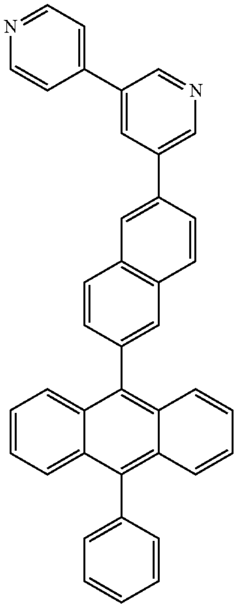
ET5
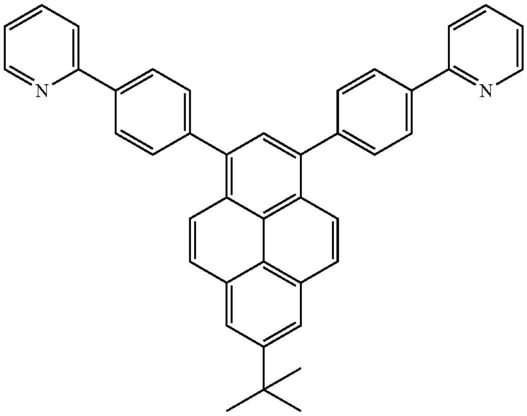
ET6
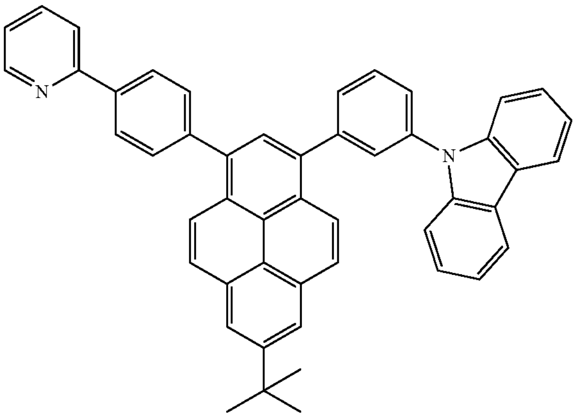

-continued
ET7
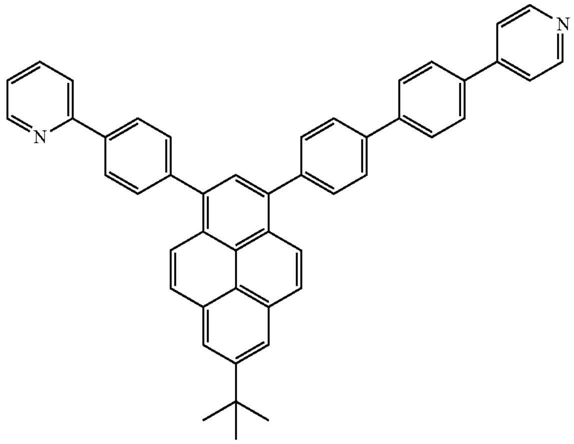
ET8
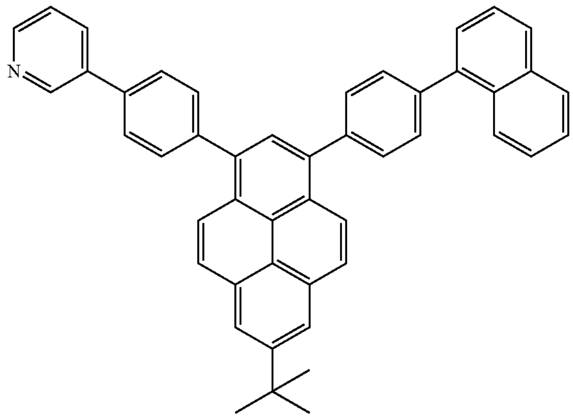
ET9
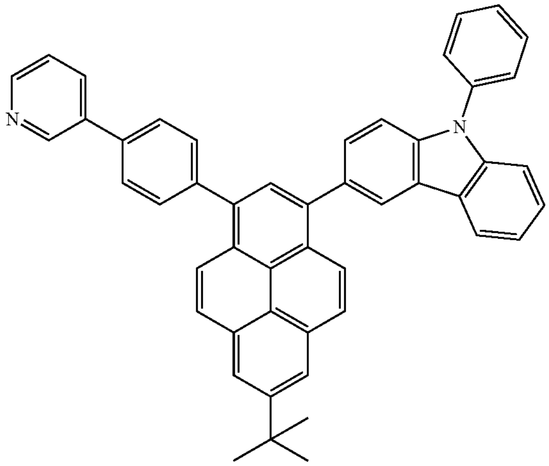
-continued
ET10
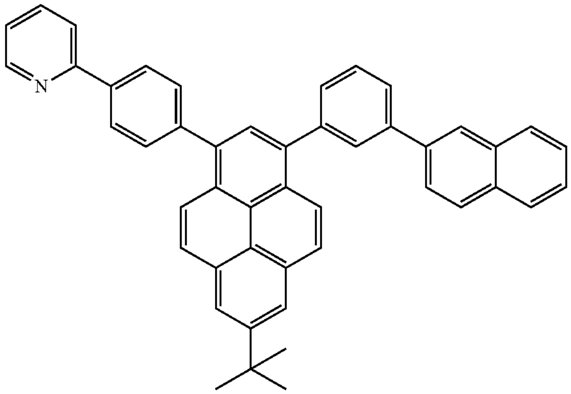
ET11
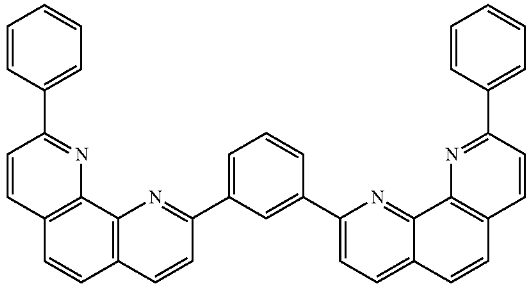
ET12
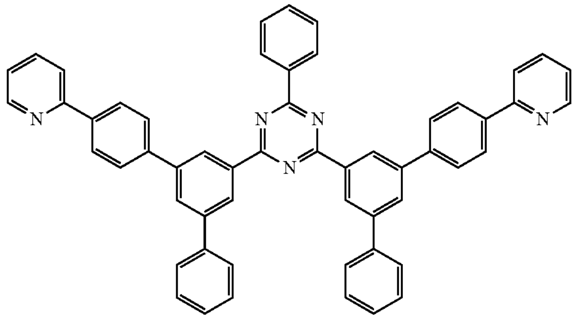
ET13
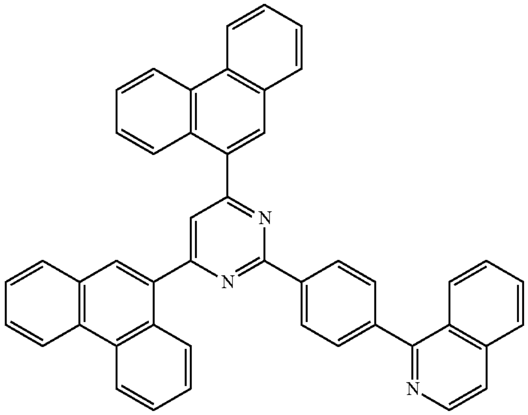

-continued
ET14
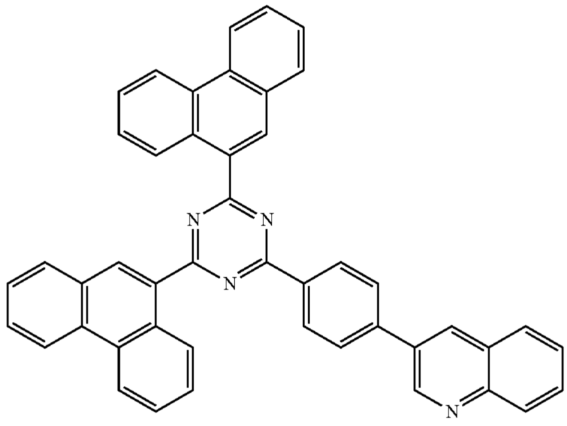
ET15
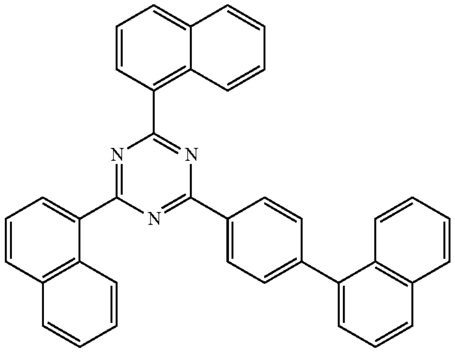
ET16
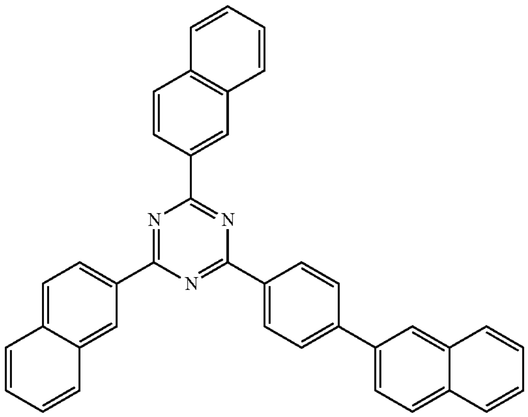
-continued
ET17
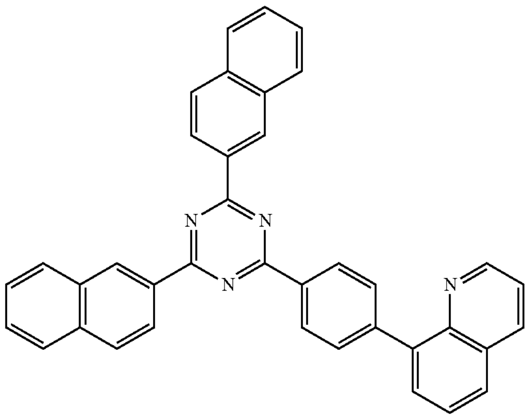
ET18
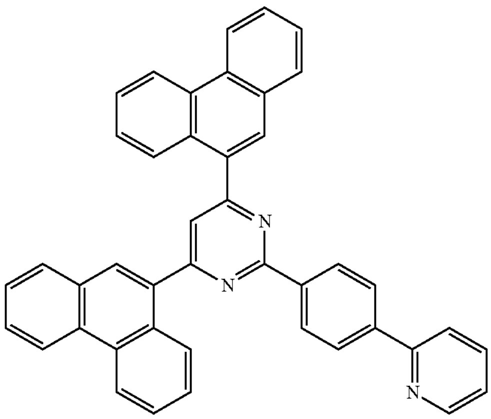
ET19
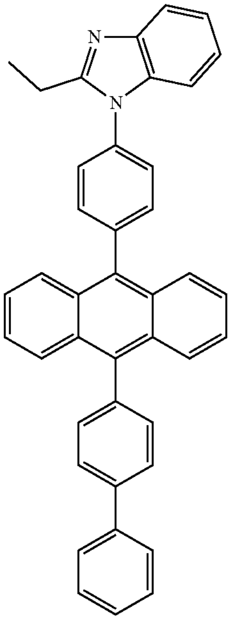

-continued
ET20
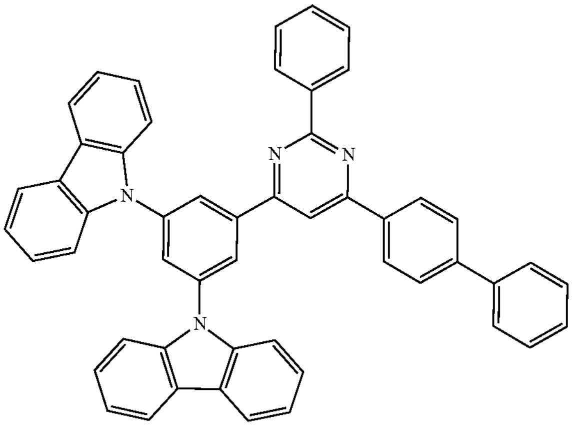
ET21
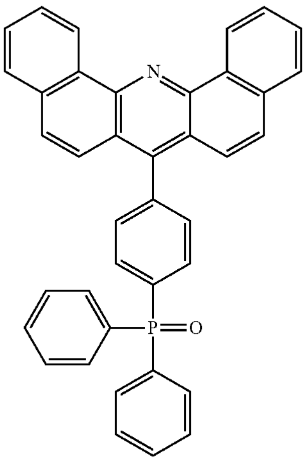
ET22
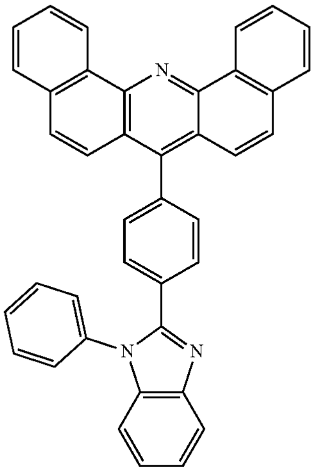
-continued
ET23
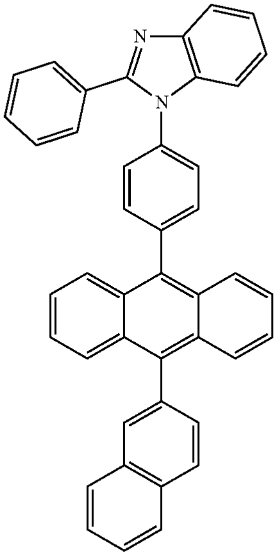
ET24
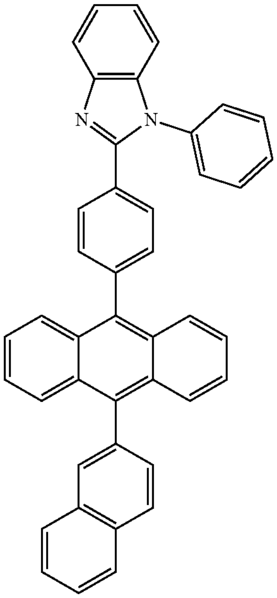
ET25
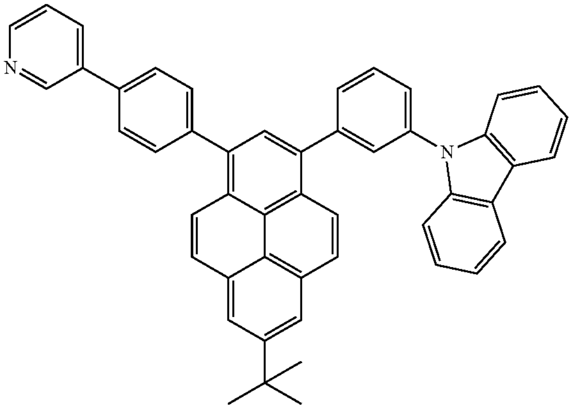
A thickness of the electron-transporting layer may be in the range of about 100 Å to about 1,000 Å, for example, about 150 Å to about 500 Å. When the thickness of the electron-transporting layer is within the range described above, the electron-transporting layer may have satisfactory electron-transporting characteristics without a substantial increase in driving voltage.

The electron-transporting layer may include a metal-containing material in addition to the material as described above.

The metal-containing material may include a Li complex. The Li complex may include, for example, Compound ET-D1 or ET-D2:

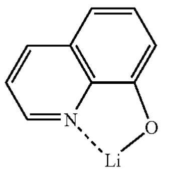
ET-D1

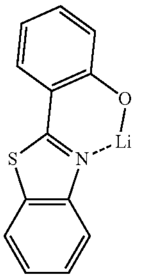
ET-D2

In one or more embodiments, the electron-transporting region 17 may include an electron injection layer (EIL) that facilitates injection of electrons from the second electrode 19.

The electron injection layer may include LiF, NaCl, CsF, $Li_2O$, BaO, or any combination thereof.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

A second electrode 19 may be provided on the electron-transporting region 17. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li ), calcium (Ca), magnesium-indium (Mg—In ), or magnesium-silver (Mg—Ag) may be used as the material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIG. 2, but embodiments of the present disclosure are not limited thereto.

According to another aspect, the light-emitting device may be included in an electronic apparatus. Thus, an electronic apparatus including the light-emitting device is provided. The electronic apparatus may include, for example, a display, an illumination, a sensor, and the like.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group• as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. For example, Formula 9-33 is a branched $C_6$ alkyl group, for example, a tert-butyl group that is substituted with two methyl groups.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof are a methoxy group, an ethoxy group, a propoxy group, a butoxy group, and a pentoxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the $C_3$-$C_{10}$ cycloalkylene group is a divalent group having the same structure as the $C_3$-$C_{10}$ cycloalkyl group.

Examples of the $C_3$-$C_{10}$ cycloalkyl group are a cyclopropyl group, a cyclobutyl group, a cyclopentyl, cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group.

The term "$C_1$-$C_{10}$ heterocycloalkyl group" as used herein refers to a monocyclic group that includes at least one hetero atom selected from N, O, P, Si, S, Se, Ge, and B as a ring-forming atom and 1 to 10 carbon atoms, and the $C_1$-$C_{10}$ heterocycloalkylene group refers to a divalent group having the same structure as the $C_1$-$C_{10}$ heterocycloalkyl group.

Examples of the $C_1$-$C_{10}$ heterocycloalkyl group are a silolanyl group, a silinanyl group, tetrahydrofuranyl group, a tetrahydro-2H-pyranyl group, and a tetrahydrothiophenyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one hetero atom selected from N, O, P, Si, S, Se, Ge, and B as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The $C_7$-$C_{60}$ alkylaryl group used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having at least one hetero atom selected from N, O, P, Si, S, Se, Ge, and B as a ring-forming atom and a cyclic aromatic system having 1 to 60 carbon atoms, and the term "$C_1$-$C_{60}$ heteroarylene group" as used herein refers to a divalent group having at least one hetero atom selected from N, O, P, Si, S, Se, Ge, and B as a ring-forming atom and a carbocyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other.

The $C_2$-$C_0$ alkylheteroaryl group used herein refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ indicates the $C_6$-$C_{60}$ aryl group), the $C_6$-$C_{60}$ arylthio group indicates —$SA_{103}$(wherein $A_{103}$ indicates the $C_6$-$C_{60}$ aryl group), and the $C_1$-$C_{60}$ alkylthio group indicates —$SA_{104}$ (wherein $A_{104}$ indicates the $C_1$-$C_{60}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom selected from N, O, P, Si, S, Se, Ge, and B, other than carbon atoms, as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as a monovalent non-aromatic heterocondensed polycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" used herein are an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, and a fluorene group (each unsubstituted or substituted with at least one $R_{10a}$).

The term "$C_1$-$C_{30}$ heterocyclic group" as used herein refers to a saturated or unsaturated cyclic group having, as a ring-forming atom, at least one heteroatom selected from N, O, P, Si, S, Se, Ge, and B other than 1 to 30 carbon atoms. The $C_1$-$C_{30}$ heterocyclic group may be a monocyclic group or a polycyclic group. The "$C_1$-$C_{30}$ heterocyclic group (unsubstituted or substituted with at least one $R_{10a}$)" may be, for example, a thiophene group, a furan group, a pyrrole group, a silole group, borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluoren-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group (each unsubstituted or substituted with at least one $R_{10a}$).

In one or more embodiments, examples of the "$C_5$-$C_{30}$ carbocyclic group" and "$C_1$-$C_{30}$ heterocyclic group" used herein include i) a third ring, ii) a fourth ring, iii) a condensed ring in which two or more third rings are condensed with each other, iv) a condensed ring in which two or more fourth rings are condensed with each other, or v) a condensed ring in which at least one third ring is condensed with at least one fourth ring, the third ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the fourth ring may be an adamantane group, a norbornane group, a norbornene group, a cyclohexane group, a cyclohexene group, a benzene group, a pyridine group, a pyrimidine group, a pyrazine group, a pyridazine group, or a triazine group.

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group," and "fluorinated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the term "fluorinated $C_1$ alkyl group (that is, a fluorinated methyl group)" includes —$CF_3$, —$CF_2H$, and —$CFH_2$. The "fluorinated $C_1$-$C_{60}$ alkyl group (or, a fluorinated $C_1$-$C_{20}$ alkyl group, or the like)", "the fluorinated $C_3$-$C_{10}$ cycloalkyl group", "the fluorinated $C_1$-$C_{10}$ heterocycloalkyl group", or "the fluorinated a phenyl group" may be i) a fully fluorinated $C_1$-$C_{60}$ alkyl group (or, a fully fluorinated $C_1$-$C_{20}$ alkyl group, or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen included therein is substituted with a fluoro group, or ii) a partially fluorinated $C_1$-$C_{50}$ alkyl group (or, a partially fluorinated $C_1$-$C_{20}$ alkyl group, or the like), a partially fluorinated $C_3$-$C_{10}$ cycloalkyl group, a partially fluorinated $C_1$-$C_{10}$ heterocycloalkyl group, or partially fluorinated phenyl group, wherein, in each group, all hydrogen included therein is not substituted with a fluoro group.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated $C_1$-$C_{10}$ heterocycloalkyl group," and "deuterated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, the deuterated methyl group)" may include —$CD_3$, —$CD_2H$, and —$CDH_2$, and examples of the "deuterated $C_3$-$C_{10}$ cycloalkyl group" are, for example, Formula 10-501 and the like. The "deuterated $C_1$-$C_{60}$ alkyl group (or, the deuterated $C_1$-$C_{20}$ alkyl group or the like)", "the deuterated $C_3$-$C_{10}$ cycloalkyl group", "the deuterated $C_1$-$C_{10}$ heterocycloalkyl group", or "the deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, in which, in each group, all hydrogen included therein are substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, in which, in each group, all hydrogen included therein are not substituted with deuterium.

The term "($C_1$-$C_{20}$ alkyl) 'X' group" as used herein refers to a X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl) phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, and a dibenzothiophene 5,5-dioxide group," in which, in each group, at least one carbon selected from ring-forming carbons is substituted with nitrogen.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group; a $C_1$-$C_{60}$ alkyl group, a $C_1$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$, alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{16}$)($Q_{19}$), —P($Q_1$a)($Q_{19}$), or any combination thereof; a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or any combination thereof, $Q_1$ to $Q_9$, $Q_{11}$ to $Q_{19}$, $Q_{21}$ to $Q_{29}$ and $Q_{31}$ to $Q_{39}$ described herein may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_1$-$C_{60}$ arylthio group; a $C_1$-$C_{60}$ heteroaryl group; a monovalent non-aromatic condensed polycyclic group; or a monovalent non-aromatic condensed heteropolycyclic group.

For example, $Q_1$ to $Q_9$, $Q_{11}$ to $Q_{19}$, $Q_{21}$ to $Q_{29}$ and $Q_{31}$ to $Q_{39}$ described herein may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

As used herein, the number of carbons in each group that is substituted (e.g., $C_1$-$C_{60}$) excludes the number of carbons in the substituent. For example, a $C_1$-$C_{60}$ alkyl group can be substituted with a $C_1$-$C_{60}$ alkyl group. The total number of carbons included in the $C_1$-$C_{60}$ alkyl group substituted with the $C_1$-$C_{60}$ alkyl group is not limited to 60 carbons. In addition, more than one $C_1$-$C_{60}$ alkyl substituent may be present on the $C_1$-$C_{60}$ alkyl group. This definition is not limited to the $C_1$-$C_{60}$ alkyl group and applies to all substituted groups that recite a carbon range.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (D-Ir(1))

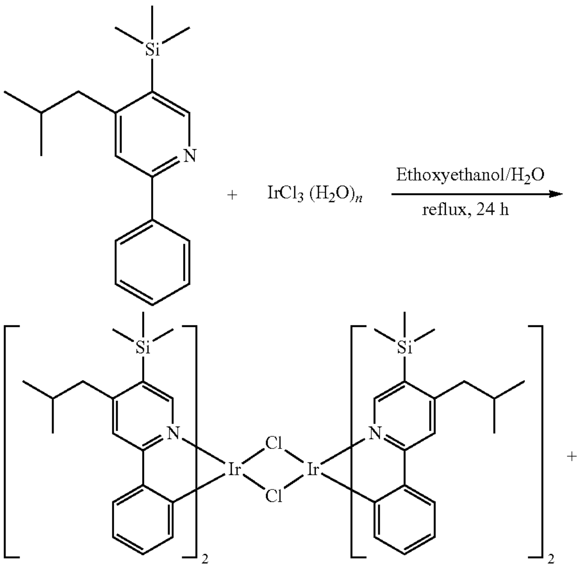

1390A

-continued

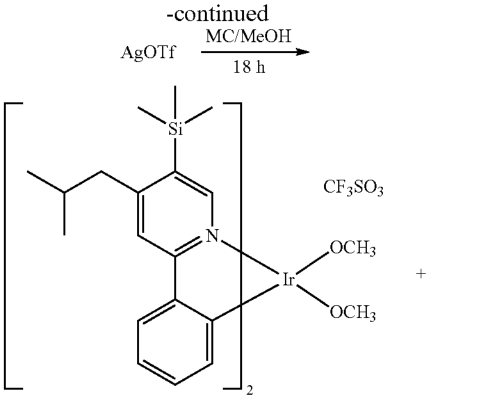

1390B

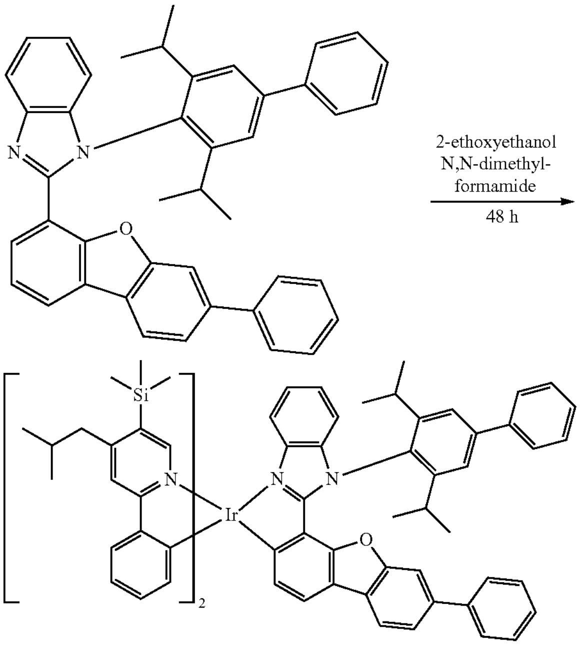

D-Ir(1)

Synthesis of Compound 1390A 4-isobutyl-2-phenyl-5-(trimethylsilyl)pyridine (33.1 mmol) and iridium chloride ($IrCl_3(H_2O)_n$) (5.2 g, 14.7 mmol) were mixed with 120 mL of ethoxyethanol and 40 mL of distilled water and then, stirred under reflux for 24 hours, and then the temperature was lowered to room temperature. The resulting solid was separated by filtration, washed sufficiently with water, methanol, and hexane, in this stated order, and then dried in a vacuum oven to obtain 7.4 g (74% of yield) of Compound 1390A.

Synthesis of Compound 1390B

Compound 1390A (1.2 mmol) and 45 mL of methylene chloride were mixed, and then, AgOTf (silver trifluoromethanesulfonate) (0.6 g, 2.3 mmol) was added thereto after being mixed with 15 mL of methanol. Thereafter, the mixture was stirred for 18 hours at room temperature while light was blocked with aluminum foil, and then filtered through Celite to remove the resulting solid, and the filtrate was subjected to reduced pressure to obtain a solid (Compound 1390B). Compound 1390B was used in the next reaction without an additional purification process.

Synthesis of D-Ir(1)(Compound 1390 of [Group 1-3])

Compound 1390B (2.3 mmol) and 1-(3,5-diisopropyl-[1,1'-biphenyl]-4-yl)-2-(7-phenyldibenzo[b,d]furan-4-yl)-1H-benzo[d]imidazole (2.8 mmol) were mixed with 50 mL of 2-ethoxyethanol and 50 mL of N,N-dimethylformamide and then, stirred under reflux for 48 hours and then, the temperature was lowered to a room temperature. The obtained mixture was subjected to a reduced pressure to obtain a solid, on which column chromatography (eluent: methylene chloride (MC) and hexane) was performed to obtain 0.56 g (yield of 39%) of D-Ir(1) (Compound 1390 of [Group 1-3]). The obtained compound was identified by mass spectrometry (MS) and high performance liquid chromatography (HPLC) analysis.

High resolution mass spectrometry (matrix-assisted laser desorption ionization) (HRMS(MALDI)) calcd for $C_{79}H_{83}IrN_4OSi_2$: m/z 1352.5735 Found: 1352.5733

Evaluation Example 1

The HOMO energy levels of the following compounds were found by the measurement using a photoelectron spectrometer (manufactured by RIKEN KEIKI Co., Ltd.: AC3) in air, and the found values are shown in Table 1.

TABLE 1

| | Compound | Measured value of HOMO energy level (eV) |
|---|---|---|
| Compounds used in Examples | HT(1) (Compound H1-8 of [Group 5-2]) | −5.60 |
| | HT(2) (Compound H1-2 of [Group 5-2]) | −5.58 |
| | E1-62 | −6.08 |
| | BP1-10 | −5.74 |
| | D-Ir(1) (Compound 1390 of [Group 1-3]) | −5.34 |
| Compounds used in Comparative Example 3 | CBP | −6.05 |
| | TCTA | −5.77 |
| | UGH3 | <−7.00 |
| | TAZ | −6.25 |
| — | $Ir(ppy)_3$ | −5.35 |

HT(1)

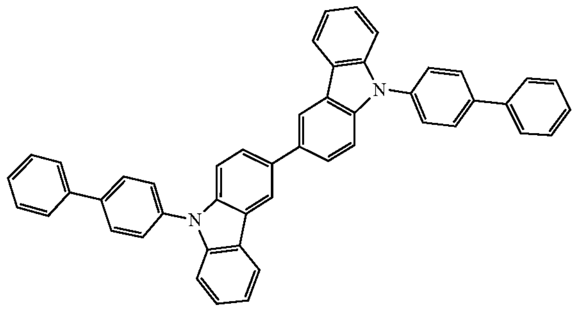

-continued
HT(2)
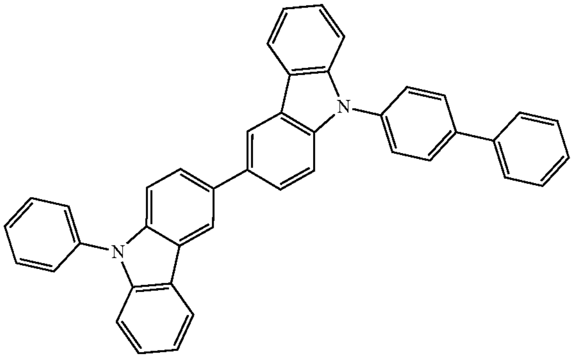
E1-62
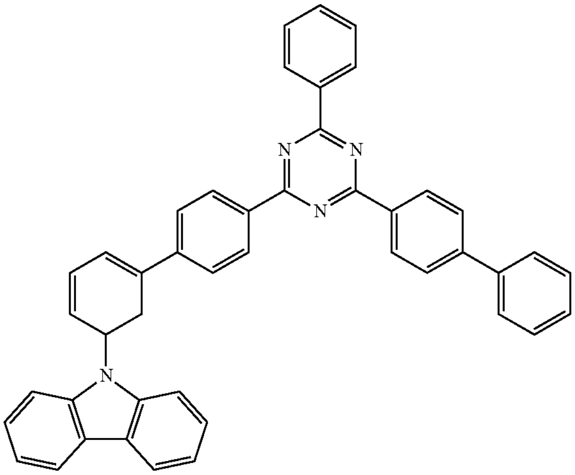
BP1-10
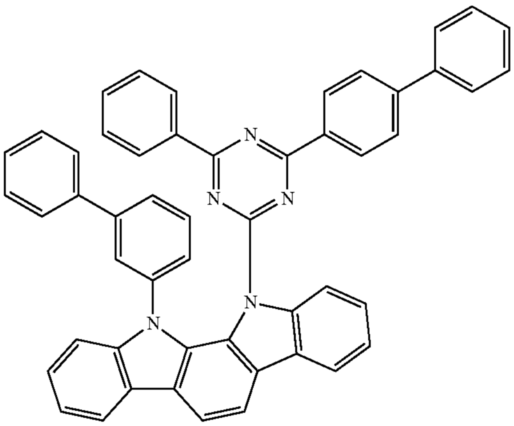
D-Ir(1)
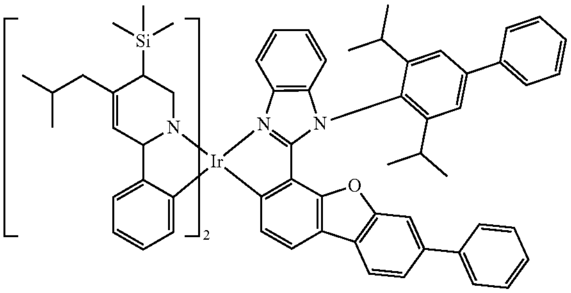
-continued
CBP
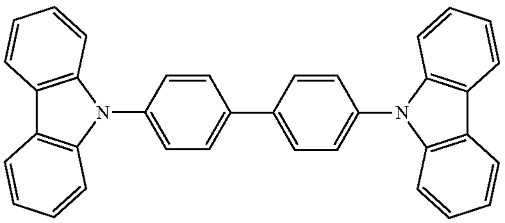
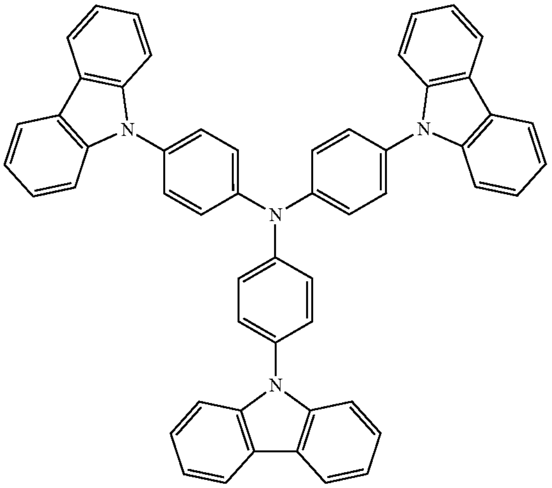
TCTA(4,4′,4″-tris(carbazol-9-yl)triphenylamine)
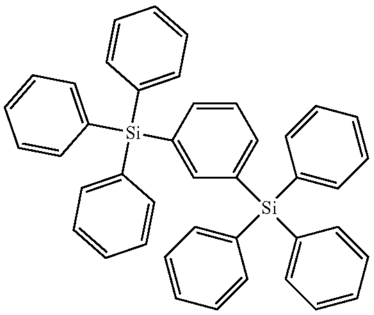
UGH3(m-bis-(triphenylsilyl)benzene)
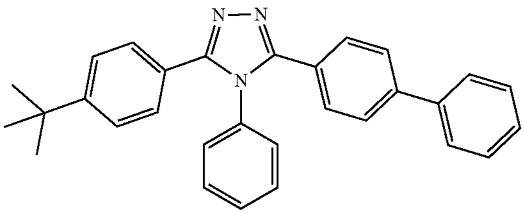
TAZ
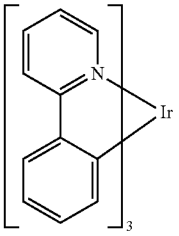
$Ir(ppy)_3$

Example 1

An ITO (as an anode)-patterned glass substrate was cut to a size of 50 mm×50 mm×0.5 mm, sonicated with isopropyl alcohol and pure water, each for 5 minutes, and then cleaned by exposure to ultraviolet rays and ozone for 30 minutes. The resultant glass substrate was loaded onto a vacuum deposition apparatus.

HT3 and F6-TCNNQ were vacuum deposited on the anode at the weight ratio of 98:2 to form a hole injection layer having a thickness of 100 Å, and then, HT3 was vacuum-deposited on the hole injection layer to form a hole-transporting layer having a thickness of 1,350 Å. HT(1) was vacuum-deposited on the hole-transporting layer to form an electron-blocking layer having a thickness of 300 Å.

Then, a first hole-transporting compound (HT(1)), a first compound (E1-62), and dopant ($Ir(ppy)_3$) were co-deposited on the electron-blocking layer to form a first emission layer having a thickness of 100 Å (10 nm), and a second hole-transporting compound (HT(2)), a second compound (BP1-10), and dopant ($Ir(ppy)_3$) were co-deposited on the first emission layer to form a second emission layer having a thickness of 300 Å (30 nm). The amount of the dopant in the first emission layer was 7 parts by weight based on 100 parts by weight of the first emission layer, the weight ratio of the first hole-transporting compound to the first compound in the first emission layer is shown in Table 2, and the amount of the dopant in the second emission layer was 7 parts by weight based on 100 parts by weight of the second emission layer, and the weight ratio of the second hole-transporting compound to the second compound in the second emission layers is shown in Table 2.

Then, ET3 and ET-D1 were co-deposited at the volume ratio of 50:50 on the emission layer to form an electron-transporting layer having a thickness of 350 Å, and ET-D1 was vacuum-deposited on the electron-transporting layer to form an electron injection layer having a thickness of 10 Å, and Al was vacuum-deposited on the electron injection layer to form a cathode having a thickness of 1000 Å, thereby completing the manufacture of an organic light-emitting device.

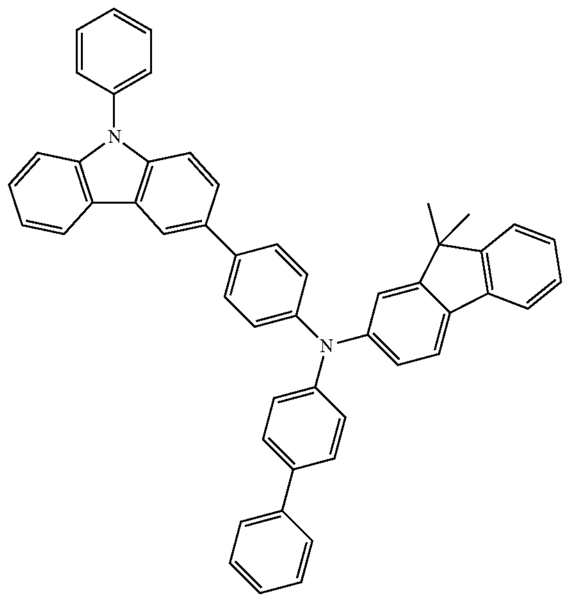

HT3

-continued

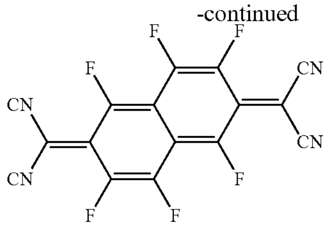

F6-TCNNQ

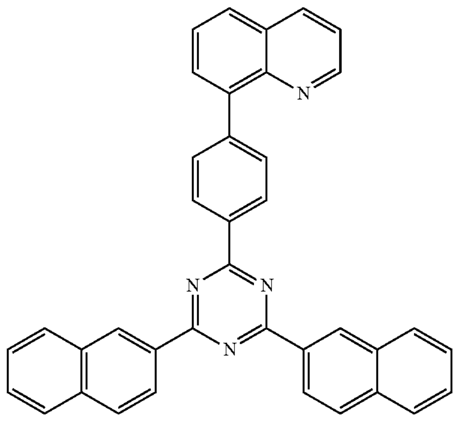

ET3

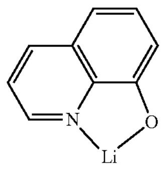

ET-D1

Comparative Examples 1 to 3

Organic light-emitting devices were manufactured in the same method as in Example 1, except that the configuration of an emission layer was changed as described in Table 2 (Comparative Example 1 did not include a second emission layer and Comparative Example 2 did not include a first emission layer)

TABLE 2

| Emission layer | | Example 1 | Comparative Example 1 | Comparative Example 2 | Comparative Example 3 |
|---|---|---|---|---|---|
| Second emission layer | Second hole-transporting compound | HT(2) | — | HT(2) | TCTA |
| | Second compound | BP1-10 | — | BP1-10 | TAZ |
| | Dopant | $Ir(ppy)_3$ | — | $Ir(ppy)_3$ | $Ir(ppy)_3$ |
| | Absolute value of the difference between the HOMO energy level of the second hole-transporting compound and the HOMO energy level of the second compound | 0.16 eV | — | 0.16 eV | 0.48 eV |
| | weight ratio of second hole-transporting compound to second compound | 5:5 | — | 5:5 | 5:5 |
| | thickness of the second emission layer | 30 nm | — | 40 nm | 30 nm |
| First emission layer | First hole-transporting compound | HT(1) | HT(1) | — | CBP |
| | First compound | E1-62 | E1-62 | — | UGH3 |
| | Dopant | $Ir(ppy)_3$ | $Ir(ppy)_3$ | — | $Ir(ppy)_3$ |
| | Weight ratio of first hole-transporting compound to first compound | 7.5:2.5 | 7.5:2.5 | — | 7.5:2.5 |
| | Thickness of the first emission layer | 10 nm | 40 nm | — | 10 nm |

For each of the organic light-emitting devices manufactured in Example I and Comparative Examples 1 to 3, the driving voltage (V), maximum value of luminescence efficiency (cd/A), roll-off ratio (%), power efficiency (lm/W), and lifespan($LT_{97}$) were evaluated, and the results are shown in Table 3. As an evaluation device, a current-voltmeter (Keithley 2400) and a luminance meter (Minolta Cs-1000A) were used, and the lifespan ($LT_{97}$) (at 8000 nit) was evaluated as the time taken for luminance to reduce to 97% of 100% of the initial luminance. Lifespan ($LT_{97}$) of Table 3 was represented as a relative value (%). The roll-off ratio was calculated according to Equation 20 below.

Roll-off ratio={1−(luminescence efficiency (at 8000 nit)/maximum luminescence efficiency)}×100% <Equation 20>

TABLE 3

| | Driving voltage (V) | Maximum value of current efficiency (cd/A) (Relative value, %) | Roll-off ratio (%) | Power efficiency (Im/W at 8000 nit) (Relative value, %) | $LT_{97}$ (Relative value, %) |
|---|---|---|---|---|---|
| Example 1 | 4.1 | 107 | 13 | 121 | 155 |
| Comparative Example 1 | 4.5 | 100 | 17 | 100 | 100 |
| Comparative Example 2 | 4.4 | 103 | 17 | 104 | 81 |
| Comparative Example 3 | 5.2 | 75 | 28 | 55 | 7 |

From Table 3, it is confirmed that the organic light-emitting device of Example 1 has improved characteristics in terms of driving voltage, luminescence efficiency, roll-off ratio, power efficiency and lifespan, compared to the organic light-emitting devices of Comparative Examples E to 3.

Examples 11 to 16

Organic light-emitting devices were manufactured in the same manner as in Example 1, except that the configuration of an emission layer is changed as shown in Table 4.

TABLE 4

| Emission layer | | Example 11 | Example 12 | Example 13 | Example 14 | Example 15 | Example 16 |
|---|---|---|---|---|---|---|---|
| Second emission layer | Second hole-transporting compound | HT(2) | HT(2) | HT(2) | HT(2) | HT(2) | HT(2) |
| | Second compound | BP1-10 | BP1-10 | BP1-10 | BP1-10 | BP1-10 | BP1-10 |
| | Dopant | D-Ir(1) | D-Ir(1) | D-Ir(1) | D-Ir(1) | D-Ir(1) | D-Ir(1) |
| | Weight ratio of second hole-transporting compound and second compound | 6:4 | 5:5 | 4:6 | 5:5 | 4:6 | 3:7 |
| | Thickness of the second emission layer | 30 nm | 30 nm | 30 nm | 20 nm | 20 nm | 20 nm |
| First emission layer | First hole-transporting compound | HT(1) | HT(1) | HT(1) | HT(1) | HT(1) | HT(1) |
| | First compound | E1-62 | E1-62 | E1-62 | E1-62 | E1-62 | E1-62 |
| | Dopant | D-Ir(1) | D-Ir(1) | D-Ir(1) | D-Ir(1) | D-Ir(1) | D-Ir(1) |
| | Weight ratio of first hole-transporting compound to first compound | 7.5:2.5 | 7.5:2.5 | 7.5:2.5 | 7.5:2.5 | 7.5:2.5 | 7.5:2.5 |
| | Thickness of the first emission layer | 10 nm | 10 nm | 10 nm | 20 nm | 20 nm | 20 nm |

Evaluation Example 3

For each of the organic light-emitting devices manufactured according to Examples 11 to 16, the driving voltage (V), the maximum value of luminescence efficiency (cd/A), the roll-off ratio (%), power efficiency (lm/W), and the lifespan ($LT_{97}$) were evaluated by using the same method as described in Evaluation Example 2, and the results are shown in Table 5. For reference, the data of Comparative Example 3 are shown in Table 5.

TABLE 5

| | Driving voltage (V) | Maximum value of current efficiency (cd/A) (Relative value, %) | Roll-off ratio (%) | Power efficiency (lm/W at 8000 nit) (Relative value, %) | $LT_{97}$ (Relative value, %) |
|---|---|---|---|---|---|
| Comparative Example 3 | 5.2 | 75 | 28 | 55 | 7 |

TABLE 5-continued

| | Driving voltage (V) | Maximum value of current efficiency (cd/A) (Relative value, %) | Roll-off ratio (%) | Power efficiency (lm/W at 8000 nit) (Relative value, %) | $LT_{97}$ (Relative value, %) |
|---|---|---|---|---|---|
| Example 11 | 3.8 | 144 | 10 | 184 | 479 |
| Example 12 | 3.5 | 148 | 9 | 203 | 424 |
| Example 13 | 3.5 | 141 | 9 | 199 | 386 |
| Example 14 | 3.9 | 144 | 8 | 183 | 548 |
| Example 15 | 3.8 | 142 | 8 | 184 | 545 |
| Example 16 | 3.7 | 144 | 6 | 193 | 445 |

From Table 5, it can be seen that the organic light-emitting devices of Examples 11 to 16 have excellent characteristics in terms of driving voltage, luminescence efficiency, roll-off ratio, power efficiency and lifespan.

Light-emitting devices according to embodiments of the present disclosure have excellent characteristics in terms of driving voltage, luminescence efficiency, roll-off ratio, power efficiency and lifespan. Accordingly, high-quality electronic devices can be manufactured using the light-emitting devices.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light-emitting device comprising:

a first electrode; a second electrode facing the first electrode; and an emission layer between the first electrode and the second electrode, wherein the emission layer comprises i) a first emission layer and ii) a second emission layer located between the first emission layer and the second electrode, the first emission layer is in direct contact with the second emission layer, the first emission layer comprises a dopant, a first hole-transporting compound, and a first compound, and the second emission layer comprises a dopant, a second hole-transporting compound, and a second compound, wherein the dopant included in the first emission layer and the dopant included in the second emission layer is a transition metal-containing organometallic compound and are identical to each other, the first compound and the second compound are different from each other, the first hole-transporting compound and the second hole-transporting compound are each a compound represented by Formula 5, the first compound is a compound represented by Formula 7, the second compound is a compound represented by Formula 9, an absolute value of the difference between a highest occupied molecular orbital (HOMO) energy level of the second hole-transporting compound and a HOMO energy level of the second compound is about 0.3 eV or less, and a HOMO energy level of the second hole-transporting compound and a HOMO energy level of the second compound are each a negative value measured by using a photoelectron spectroscope in air Formula 5

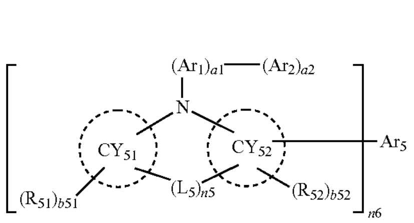

Formula 7

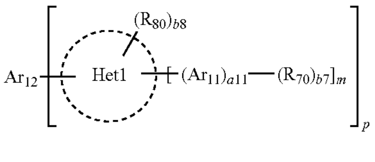

-continued

Formula 9

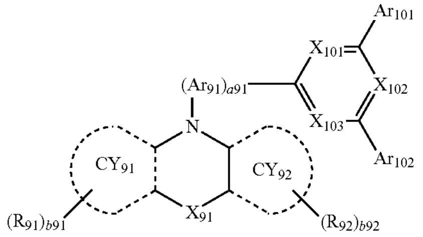

wherein $Ar_1$, $Ar_2$, $Ar_{11}$, $Ar_{101}$, and $Ar_{102}$ in Formula 5, Formula 7, and Formula 9 are each independently a $C_5$-$C_{60}$ carbocylic group unsubstituted or substituted with at least one $R_{50}$ or a $C_1$-$C_{60}$ heterocyclic group unsubstituted or substituted with at least one $R_{50}$, $Ar_{91}$ in Formula 9 is a single bond, a $C_5$-$C_{60}$ carbocyclic group unsubstituted or substituted with at least one $R_{90}$, or a $C_1$-$C_{60}$ heterocyclic group unsubstituted or substituted with at least one $R_{90}$, $Ar_5$ and $Ar_{12}$ in Formula 5 and Formula 7 is a single bond, a $C_5$-$C_{60}$ carbocyclic group unsubstituted or substituted with at least one $R_{50a}$, or a $C_1$-$C_{60}$ heterocyclic group unsubstituted or substituted with at least one $R_{50a}$, or $Ar_5$ may not exist, Het1 in Formula 7 may be a π electron-deficient nitrogen-containing $C_1$-$C_{60}$ cyclic group, n6 in Formula 5 is 1, 2, or 3, and when n6 is 1, $Ar_5$ does not exist, p in Formula 7 may be 1, 2, or 3, and when p is 1, $Ar_{12}$ may not exist, a1 and a2 in Formula 5 are each independently an integer from 0 to 5, and the sum of a1 and a2 is 1 to 10, ring $CY_{51}$, ring $CY_{52}$, ring $CY_{91}$ and ring $CY_{92}$ in Formula 5 and Formula 9 are each independently a $C_5$-$C_{60}$ carbocyclic group or a $C_1$-$C_{60}$ heterocyclic group, and ring $CY_{51}$ and ring $CY_{52}$ are optionally combined with each other with a $C_5$-$C_{60}$ carbocyclic group unsubstituted or substituted with at least one $R_{50b}$ or a $C_1$-$C_{60}$ heterocylic group unsubstituted or substituted with at least one $R_{50b}$ therebetween, $L_5$ in Formula 5 is a single bond, O, S, $N(R_{50c})$, $C(R_{50c})(R_{50d})$, or $Si(R_{50c})(R_{50d})$, and n5 is 0 or 1, wherein, when n5 is 0, $L_5$ does not exist, a11 and a91 in Formula 9, and m in Formula 7, are independently an integer from 1 to 10, $X_{101}$ in Formula 9 is N or $C(R_{101})$, $X_{102}$ in Formula 9 is N or $C(R_{102})$, $X_{103}$ in Formula 9 is N or $C(R_{103})$, and at least two of $X_{101}$ to $X_{103}$ are N, $X_{91}$ in Formula 9 is a single bond, O, S, $N(R_{91a})$, $C(R_{91a})(R_{91b})$, or $Si(R_{91a})(R_{91b})$, $R_{50}$, $R_{51}$, $R_{52}$, $R_{50a}$, to $R_{50d}$, $R_{70}$, $R_{80}$, $R_{90}$, $R_{91}$, $R_{92}$, $R_{91a}$, $R_{91b}$, $R_{101}$, $R_{102}$, and $R_{103}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, and $Q_1$ to $Q_9$ are each independently: hydrogen; deuterium; —F; a $C_1$-$C_{60}$ alkyl group which is unsubstituted or substituted with deuterium; or a $C_6$-$C_{60}$ aryl group which is unsubstituted or substituted with deuterium, a $C_1$-$C_{60}$ alkyl group, a $C_6$-$C_{60}$ aryl group, or any combination thereof, and b51 to b54, b7, b8, b73, b8, b83, b91, and b92 are each independently an integer from 0 to 10.

2. The light-emitting device of claim 1, wherein the dopant is a phosphorescent dopant.

3. The light-emitting device of claim 1, wherein the first hole-transporting compound and the second hole-transporting compound are different from each other.

4. The light-emitting device of claim 1, wherein the first hole-transporting compound and the second hole-transporting compound are identical to each other.

5. The light-emitting device of claim 1, wherein a minimum value of the HOMO energy level of the first hole-transporting compound and the HOMO energy level of the second hole-transporting compound are about −5.80 eV or more.

6. The light-emitting device of claim 1, wherein the HOMO energy level of the first hole-transporting compound and the HOMO energy level of the second hole-transporting compound are each about −5.80 eV or more.

7. The light-emitting device of claim 1, wherein the HOMO energy level of the first compound is smaller than the HOMO energy level of the second compound.

8. The light-emitting device of claim 1, wherein the HOMO energy level of the first compound and the HOMO energy level of the second compound are each about −6.15 eV or more.

9. The light-emitting device of claim 1, wherein the HOMO energy level of the second compound is about −6.00 eV or more.

10. The light-emitting device of claim 1, wherein the HOMO energy level of the second compound is about −5.80 eV or more.

11. The light-emitting device of claim 1, wherein an absolute value of the difference between the HOMO energy level of the second hole-transporting compound and the HOMO energy level of the second compound is about 0.16 eV or less.

12. The light-emitting device of claim 1, wherein a maximum value from among the HOMO energy level of the first hole-transporting compound, the HOMO energy level of the first compound, the HOMO energy level of the second hole-transporting compound, and the HOMO energy level of the second compound is smaller than a HOMO energy level of the dopant.

13. The light-emitting device of claim 1, wherein a HOMO energy level of the dopant is from about −5.60 eV to about −5.20 eV.

14. The light-emitting device of claim 1, wherein a thickness of the second emission layer is identical to a thickness of the first emission layer.

15. The light-emitting device of claim 1, wherein a thickness of the second emission layer is greater than a thickness of the first emission layer.

16. The light-emitting device of claim 1, wherein light emitted from the emission layer to the outside through at least one of the first electrode and the second electrode is not white light.

17. The light-emitting device of claim 1, wherein light emitted from the emission layer to the outside through at least one of the first electrode and the second electrode is green light having a maximum emission wavelength of about 500 nm to about 580 nm.

18. The light-emitting device of claim 1, further comprising a hole-transporting region located between the first electrode and the emission layer, wherein the hole-transporting region does not include a charge-generation layer and an emission layer.

19. The light-emitting device of claim 1, further comprising an electron-transporting region, which is located between the emission layer and the second electrode, wherein the electron-transporting region does not include a charge-generation layer and an emission layer.

20. An electronic apparatus comprising the light-emitting device of claim 1.

* * * * *